US012720944B2

(12) United States Patent
Hong et al.

(10) Patent No.: US 12,720,944 B2
(45) Date of Patent: Aug. 25, 2026

(54) COMPOSITION, LIGHT-EMITTING DEVICE INCLUDING THE SAME, AND ELECTRONIC APPARATUS INCLUDING THE LIGHT-EMITTING DEVICE

(71) Applicant: Samsung Electronics Co., Ltd., Suwon-si (KR)

(72) Inventors: Youngki Hong, Suwon-si (KR); Seungyeon Kwak, Suwon-si (KR); Sungmin Kim, Suwon-si (KR); Sunghun Lee, Suwon-si (KR); Shingo Ishihara, Suwon-si (KR); Yong Joo Lee, Suwon-si (KR); Byoungki Choi, Suwon-si (KR); Kyuyoung Hwang, Suwon-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 525 days.

(21) Appl. No.: 18/360,967

(22) Filed: Jul. 28, 2023

(65) Prior Publication Data

US 2024/0099046 A1 Mar. 21, 2024

(30) Foreign Application Priority Data

Jul. 29, 2022 (KR) ........................ 10-2022-0095044

(51) Int. Cl.
*H10K 50/125* (2023.01)
*H10K 50/12* (2023.01)
*H10K 50/805* (2023.01)
*H10K 85/30* (2023.01)

(52) U.S. Cl.
CPC ........... *H10K 50/125* (2023.02); *H10K 50/12* (2023.02); *H10K 50/805* (2023.02); *H10K 85/342* (2023.02)

(58) Field of Classification Search
CPC ........ H10K 50/11; H10K 50/12; H10K 50/13; H10K 50/125
See application file for complete search history.

(56) References Cited

U.S. PATENT DOCUMENTS

| | | | |
|---|---|---|---|
| 8,431,243 | B2 | 4/2013 | Kwong et al. |
| 9,064,822 | B2 | 6/2015 | Park et al. |
| 9,685,617 | B2 | 6/2017 | Beers et al. |
| 2015/0228697 | A1 | 8/2015 | Liu et al. |

(Continued)

FOREIGN PATENT DOCUMENTS

| | | | |
|---|---|---|---|
| DE | 102020209377 | A1 | 12/2021 |
| EP | 2465912 | A1 | 6/2012 |

(Continued)

OTHER PUBLICATIONS

Extended European Search Report issued Dec. 19, 2023 of EP Patent Application No. 23187833.1.

*Primary Examiner* — Khanh T Nguyen
(74) *Attorney, Agent, or Firm* — CANTOR COLBURN LLP

(57) ABSTRACT

A composition, including m1 dopants; and m2 hosts, wherein m1 and m2 are each an integer of 1 or greater, when m1 is 2 or greater, two or more of the m1 dopants are different from each other, when m2 is 2 or greater, two or more of the m2 hosts are different from each other, and the composition has an image-modifying coordinate represented by:

(X,Y)

as defined herein.

20 Claims, 2 Drawing Sheets

(56) References Cited

U.S. PATENT DOCUMENTS

| | | | |
|---|---|---|---|
| 2015/0318506 | A1 | 11/2015 | Zhou et al. |
| 2015/0371606 | A1 | 12/2015 | Lee |
| 2016/0093814 | A1 | 3/2016 | Hwang et al. |
| 2016/0190501 | A1 | 6/2016 | Kim et al. |
| 2018/0254417 | A1* | 9/2018 | Ma ..................... H10K 85/6572 |
| 2018/0374409 | A1 | 12/2018 | Lee et al. |
| 2019/0006608 | A1 | 1/2019 | Koo et al. |
| 2019/0074468 | A1 | 3/2019 | Kwak et al. |
| 2019/0157354 | A1 | 5/2019 | Lee et al. |
| 2020/0212319 | A1 | 7/2020 | Choi et al. |
| 2021/0083205 | A1 | 3/2021 | Hwang et al. |
| 2021/0104691 | A1 | 4/2021 | Lee et al. |
| 2021/0313536 | A1 | 10/2021 | Choi et al. |
| 2021/0403496 | A1 | 12/2021 | Cai et al. |
| 2022/0052278 | A1 | 2/2022 | Lee et al. |
| 2022/0402952 | A1 | 12/2022 | Kwak et al. |
| 2023/0025356 | A1 | 1/2023 | Lee et al. |
| 2023/0050840 | A1 | 2/2023 | Yi et al. |
| 2023/0054166 | A1 | 2/2023 | Lee et al. |
| 2023/0105127 | A1 | 4/2023 | Kwak et al. |
| 2024/0065091 | A1 | 2/2024 | Lee et al. |

FOREIGN PATENT DOCUMENTS

| | | | |
|---|---|---|---|
| EP | 3792270 | A1 | 3/2021 |
| EP | 3904363 | A1 | 11/2021 |
| EP | 3912983 | A1 | 11/2021 |
| KR | 20160000059 | A | 1/2016 |
| KR | 20190026618 | A | 3/2019 |
| KR | 20210122930 | A | 10/2021 |
| KR | 20210133796 | A | 11/2021 |
| KR | 102343655 | B1 | 12/2021 |
| KR | 20240016819 | A | 2/2024 |

* cited by examiner

COMPOSITION, LIGHT-EMITTING DEVICE INCLUDING THE SAME, AND ELECTRONIC APPARATUS INCLUDING THE LIGHT-EMITTING DEVICE

CROSS-REFERENCE TO RELATED APPLICATION

This application claims priority to and the benefit of Korean Patent Applications Nos. 10-2022-0095044, filed on Jul. 29, 2022, and 10-2023-0097229, filed on Jul. 26, 2023, in the Korean Intellectual Property Office, and all the benefits accruing therefrom under 35 U.S.C. § 119, the contents of which are incorporated herein in their entireties by reference.

BACKGROUND

1. Field

The present subject matter relates to a composition, a light-emitting device including the same, and an electronic apparatus including the light-emitting device.

2. Description of the Related Art

From among light-emitting devices, organic light-emitting devices (OLEDs) are self-emissive devices, which have improved characteristics in terms of viewing angles, response time, luminance, driving voltage, and response speed. In addition, OLEDs can produce full-color images.

For example, a typical OLED may include an anode, a cathode, and an organic layer located between the anode and the cathode, wherein the organic layer includes an emission layer. A hole transport region may be located between the anode and the emission layer, and an electron transport region may be located between the emission layer and the cathode. Holes provided from the anode may move toward the emission layer through the hole transport region, and electrons provided from the cathode may move toward the emission layer through the electron transport region. The holes and the electrons may then recombine in the emission layer to produce excitons. The excitons may transition from an excited state to a ground state, thus generating light.

SUMMARY

Provided are a composition capable of improving turn-off time of the light-emitting device and a light-emitting device of which turn-off time is improved by using the composition. Also provided is an electronic apparatus including the light-emitting device.

Additional aspects will be set forth in part in the detailed description that follows and, in part, will be apparent from the description, or may be learned by practice of the presented embodiments.

According to an aspect, a composition includes m1 dopants, and m2 hosts, wherein m1 and m2 are each an integer of 1 or greater, when m1 is 2 or greater, two or more of dopants are different from each other, when m2 is 2 or greater, two or more of hosts are different from each other, and the composition has an image-modifying coordinate represented by (X,Y)

wherein

X is a sum of $$\sum_{x=1}^{m1} DM(Dx)\cdot W(Dx) \text{ and } \sum_{y=1}^{m2} DM(Hy)\cdot W(Hy),$$

and is in debye,

Y is calculated by {HOMO($H_{min}$)–HOMO($D_{min}$)}×{1−W($H_{LUMO\_max}$)}, and is in electron volt (eV), the image-modifying coordinate exists within a quadrangle having four vertices at (1.112, 0.119), (1.720, 0.119), (1.530, 0.160), and (1.112, 0.180), x is a variable of 1 to m1, y is a variable of 1 to m2, DM(Dx) is a dipole moment of a $x^{th}$ dopant, and is in debye, DM(Hy) is a dipole moment of an $y^{th}$ host, and is in debye, each of Dm(Dx) and Dm(Hy) is calculated based on a density functional theory, W(Dx) is a weight fraction of a $x^{th}$ dopant with respect to a total weight of the m1 dopants and the m2 hosts, and W(Hy) is a weight fraction of an $y^{th}$ host with respect to the total weight of the m1 dopants and the m2 hosts, HOMO($H_{min}$) is a smallest value among absolute values of highest occupied molecular orbital energy levels of the m2 hosts, and is in eV, HOMO($D_{min}$) is a smallest value among absolute values of the highest occupied molecular orbital energy levels of the m1 dopants, and is in eV, W($H_{LUMO\_max}$) is a weight fraction of a host having a largest value among absolute values of lowest unoccupied molecular orbital energy level of the m2 hosts with respect to the total weight of the m1 dopants and the m2 hosts, and each of the highest occupied molecular orbital energy levels and the lowest unoccupied molecular orbital energy level is a negative value measured using differential pulse voltammetry using ferrocene as a reference material.

According to another aspect, a light-emitting device includes a first electrode, a second electrode opposing the first electrode, and an interlayer arranged between the first electrode and the second electrode, wherein the interlayer comprises an emission layer, and wherein the emission layer includes the composition.

For example, the interlayer of the light-emitting device may include m light-emitting units that each include at least one emission layer, and m−1 charge generation layers arranged between two neighboring light-emitting units of the m light-emitting units, wherein m is an integer of 2 or greater, and an emission layer of at least one light-emitting unit among m light-emitting units may include the composition.

In one or more embodiments, the light-emitting device may further include a substrate including a red subpixel, a green subpixel, and a blue subpixel, the first electrode is patterned for each of the red subpixel, the green subpixel, and the blue subpixel, the emission layer may include a red emission layer corresponding to the red subpixel, a green emission layer corresponding to the green subpixel, and a blue emission layer corresponding to the blue subpixel, and the green emission layer includes the composition as described herein.

According to another aspect, an electronic apparatus includes the light-emitting device.

BRIEF DESCRIPTION OF THE DRAWINGS

These and/or other aspects will become apparent and more readily appreciated from the following description of the embodiments, taken in conjunction with.

DETAILED DESCRIPTION

Figure 1:
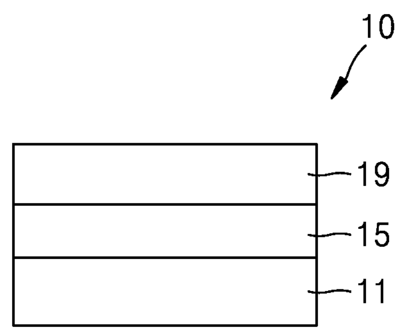
FIG. 1 is a schematic view of a light-emitting device 10 according to one or more embodiments.

Reference will now be made in further detail to exemplary embodiments, examples of which are illustrated in the accompanying drawings, wherein like reference numerals refer to like elements throughout. In this regard, the exemplary embodiments may have different forms and should not be construed as being limited to the detailed descriptions set forth herein. Accordingly, the exemplary embodiments are merely described in further detail below by referring to the figures, to explain certain aspects and features. As used herein, the term "and/or" includes any and all combinations of one or more of the associated listed items. Expressions such as "at least one of," when preceding a list of elements, modify the entire list of elements and do not modify the individual elements of the list.

The terminology used herein is for the purpose of describing one or more exemplary embodiments only and is not intended to be limiting. As used herein, the singular forms "a," "an," and "the" are intended to include the plural forms as well, unless the context clearly indicates otherwise. The term "or" means "and/or." It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

It will be understood that, although the terms first, second, third etc. may be used herein to describe various elements, components, regions, layers, and/or sections, these elements, components, regions, layers, and/or sections should not be limited by these terms. These terms are only used to distinguish one element, component, region, layer, or section from another element, component, region, layer, or section. Thus, a first element, component, region, layer, or section discussed below could be termed a second element, component, region, layer, or section without departing from the teachings of the present embodiments.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

It will be understood that when an element is referred to as being "on" another element, it can be directly in contact with the other element or intervening elements may be present therebetween. In contrast, when an element is referred to as being "directly on" another element, there are no intervening elements present.

Unless otherwise defined, all terms (including technical and scientific terms) used herein have the same meaning as commonly understood by one of ordinary skill in the art to which this general inventive concept belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

A composition according to an aspect includes m1 dopants and m2 hosts.

In the composition, a total weight of the m2 hosts may be greater than a total weight of the m1 dopants. In other words, a total amount of the m1 dopants in the composition may be greater than a total amount of the m2 hosts in the composition, based on a total weight of the composition.

Each of m1 and m2 is an integer of 1 or greater. For example, m1 and m2 may each independently be an integer of 1 to 5, or an integer of 1 to 3.

When m1 is 2 or greater, two or more of dopants are different from each other. That is, the composition may include one type of dopant, or may include two or more types of dopants that are different from each other.

When m2 is 2 or greater, two or more of hosts are different from each other. That is, the composition may include one type of host, or may include two or more types of hosts that are different from each other.

In one or more embodiments, m1 and m2 may each independently be 1 or 2. For example, m1 may be 1 and m2 may be 2.

The composition has an image-modifying coordinate (IM coordinate) represented by:

$$(X,Y).$$

X is a sum of $$\sum_{x=1}^{m1} DM(Dx)\cdot W(Dx) \text{ and } \sum_{y=1}^{m2} DM(Hy)\cdot W(Hy),$$

and is in debye, and Y is calculated by $\{HOMO(H_{min})-HOMO(D_{min})\}\times\{1-W(H_{LUMO\_max})\}$, and is in electron volt (eV). image-modifying coordinate that is defined by (X, Y)

exists within a quadrangle having four vertices at (1.112, 0.119), (1.720, 0.119), (1.530, 0.160), and (1.112, 0.180) (including existing on its boundaries).

In $$\sum_{x=1}^{m1} DM(Dx)\cdot W(Dx),$$

x is a variable of 1 to m1.

In $$\sum_{y=1}^{m2} DM(Hy)\cdot W(Hy),$$

y is a variable of 1 to m2.

DM(Dx) is a dipole moment of a $x^{th}$ dopant, and is in debye, and DM(Hy) is a dipole moment of an $y^{th}$ host, and is in debye.

Each of DM(Dx) and DM(Hy) is calculated based on a density functional theory (DFT). The calculation method based on DFT may be performed using various programs (for example, Gaussian 16 program, or the like).

In one or more embodiments, when the dopant is an organometallic compound, the dopant molecular structure may be optimized by using the B3LYP/LanL2DZ function for the metal in the dopant and the B3LYP/6-31 G(D,P) function for an organic ligand in the dopant, and then, the density functional theory (DFT) calculation may be performed using the Gaussian 16 program to calculate the dipole moment of the dopant (for example, see Table 1).

In one or more embodiments, with respect to the host, each molecular structure may be optimized using the B3LYP/6-31G(D,P) function, and then, the density functional theory (DFT) calculation using the Gaussian 16 program may be performed to calculate the dipole moment of the host (for example, see Table 1).

W(Dx) is a weight fraction of a $x^{th}$ dopant with respect to a total weight of the m1 dopants and the m2 hosts. For example, W(Dx) may be calculated by weight of the $x^{th}$ dopant/total weight of the m1 dopants and the m2 hosts.

W(Hy) is a weight fraction of the $y^{th}$ host with respect to the total weight of the m1 dopants and the m2 hosts. For example, W(Hy) may be calculated by weight of the $y^{th}$ host/total weight of the m1 dopants and the m2 hosts.

The sum of "W(D1)+W(D2)+ . . . +W(Dx-1)+W(Dx)" and "W(H1)+W(H2)+ . . . +W(Hy-1)+W(Hy)" in the emission layer may be 1.

In one or more embodiments, "W(D1)+W(D2)+ . . . +W(Dx-1)+W(Dx)" may be from about 0.03 to about 0.20, from about 0.05 to about 0.18, from about 0.05 to about 0.10, or from about 0.07 to about 0.15.

In one or more embodiments, "W(H1)+W(H2)+ . . . +W(Hy-1)+W(Hy)" may be from about 0.80 to about 0.97, from about 0.82 to about 0.95, from about 0.90 to about 0.95, or from about 0.85 to about 0.93.

For example, when in the composition, m1 is 1 and m2 is 2, the dopant includes only the first dopant, the host includes a first host and a second host that are different from each other, $$\sum_{x=1}^{m1} DM(Dx)\cdot W(Dx)$$

is DM(D1)·W(D1), that is, "dipole moment of first dopant× weight fraction of first dopant", and $$\sum_{y=1}^{m2} DM(Hy)\cdot W(Hy)$$

is DM(H1)·W(H1)+DM(H2)·W(H2), that is, "(dipole moment of first host×weight fraction of first host)+(dipole moment of second host×weight fraction of second host)."

In one or more embodiments, when each of m1 and m2 in the emission layer is 2, the dopant includes a first dopant and a second dopant that are different from each other, the host includes a first host and a second host that are different from each other, $$\sum_{x=1}^{m1} DM(Dx)\cdot W(Dx)$$

is DM(D1)·W(D1)+DM(D2)·W(D2), that is, "(dipole moment of first dopant x weight fraction of first dopant)+(dipole moment of second dopant×weight fraction of second dopant)", and $$\sum_{y=1}^{m2} DM(Hy)\cdot W(Hy)$$

is, DM(H1)·W(H1)+DM(H2)·W(H2), that is, "(dipole moment of first host x weight fraction of first host)+(dipole moment of second host×weight fraction of second host)."

The first host may be a hole-transporting compound, and the second host may be an electron-transporting compound. Each of the hole-transporting compound and the electron-transporting compound may be understood by referring to the description provided herein.

In one or more embodiments, the first host may be a hole-transporting compound, the second host may be an electron-transporting compound, and the weight fraction of the first host W(H1) and the weight fraction of the second host W(H2) may be W(H1)>W(H2).

In one or more embodiments, the first host may be a hole-transporting compound, the second host may be an electron-transporting compound, and W(H1) may be from about 0.5 to about 0.7, for example, from about 0.503 to about 0.697, from about 0.503 to about 0.651, or from about 0.558 to about 0.651.

In one or more embodiments, the first host may be a hole-transporting compound, the second host may be an electron-transporting compound, and W(H2) may be from about 0.2 to about 0.45, for example, from about 0.225 to about 0.427, or from about 0.233 to about 0.427.

In one or more embodiments, the dipole moment of at least one dopant of m1 dopants (e.g., each of the m1 dopants) in the composition may be about 6 debye or less, for example, about 1.5 debye to about 6 debye, or about 1.5 debye to about 5 debye, or about 1.5 debye to about 4 debye.

Meanwhile, HOMO($H_{min}$) is a smallest value among absolute values of a highest occupied molecular orbital energy levels of the m2 hosts, and is in eV, a HOMO($D_{min}$) is a smallest value among absolute values of a highest occupied molecular orbital energy levels of the m1 dopants, and is in eV, and W($H_{LUMO\_max}$) is a weight fraction of a host having a largest value among absolute values of lowest unoccupied molecular orbital (LUMO) energy levels of the m2 hosts with respect to the total weight of the m1 dopants and the m2 hosts.

Each of the HOMO energy level and the LUMO energy level is a negative value measured using differential pulse voltammetry using ferrocene as a reference material. For example, each of the HOMO energy level and the LUMO energy level may be measured according to the method described in Table 1.

In one or more embodiments, the composition may have an image-modifying coordinate represented by (X, Y) satisfying the conditions of about 1.112≤X≤about 1.534 and about 0.119≤Y≤about 0.160 or about 1.112≤X≤about 1.534 and about 0.119≤Y≤about 0.151.

In one or more embodiments, at least one (for example, each of the m1 dopants) of the m1 dopants in the composition may emit a green light.

In one or more embodiments, a maximum emission wavelength (peak emission wavelength) in the luminescence spectrum of at least one (for example, each of the m1 dopants) of the m1 dopants in the composition may be from about 500 nanometers (nm) to about 580 nm, for example, about 510 nm to about 540 nm.

When the composition has an image-modifying coordinate represented by (X, Y) that exists within a quadrangle with 4 vertices at (1.112, 0.119), (1.720, 0.119), (1.530, 0.160), and (1.112, 0.180), the turn-off time of the light-emitting device using the composition may be reduced. Accordingly, the occurrence of a residual image after the current is turned off or stopped for the light-emitting device using the composition can be substantially prevented. Furthermore, the turn-on time of the light-emitting device using the composition may be reduced. Accordingly, the color drag phenomenon after the current is applied to the light-emitting device using the composition may be substantially prevented.

For example, when at least one of the m1 dopants (for example, each of the m1 dopants) included in the composition emits a green light, the light-emitting device using the composition may emit a green light while the turn-off time thereof is simultaneously reduced. Additionally, the turn-on time is also reduced.

Accordingly, by using the light-emitting device using the composition, a high-quality electronic apparatus (for example, a display apparatus) can be manufactured.

At least one of the m1 dopants (for example, each of the m1 dopants) may be a transition metal-containing organometallic compound, and each of the m2 hosts may be a compound that may not include a transition metal. In other words, each of the m2 hosts may be an organic compound.

In one or more embodiments, at least one of the m1 dopants (for example, each of the m1 dopants) is an iridium-containing organometallic compound, and the iridium-containing organometallic compound may contain a first ligand, a second ligand, and a third ligand, wherein the first ligand, the second ligand, and the third ligand are each bound to iridium, and each of the first ligand, the second ligand, and the third ligand may be a bidentate ligand that is bonded to the iridium via C and N.

For example,

The first ligand, the second ligand, and the third ligand may be identical to each other, or the first ligand and the second ligand may be identical to each other, and the second ligand and the third ligand may be different from each other, or the first ligand and the second ligand may be different from each other, and the second ligand and the third ligand may be identical to each other, or the first ligand, the second ligand, and the third ligand may be different from each other.

In one or more embodiments, the first ligand, the second ligand, and the third ligand may be identical to each other.

In one or more embodiments, at least one of the m1 dopants (for example, each of the m1 dopants) is an iridium-containing organometallic compound, and the iridium-containing organometallic compound may include at least one of deuterium, a fluoro group, Si, Ge, or a combination thereof. For example, the iridium-containing organometallic compound may include at least one of deuterium, a fluoro group, a deuterated $C_1$-$C_{20}$ alkyl group, a fluorinated $C_1$-$C_{20}$ alkyl group, —Si($Q_3$)($Q_4$)($Q_5$), —Ge($Q_3$)($Q_4$)($Q_5$), or a combination thereof, wherein $Q_3$ to $Q_5$ may each independently be a $C_1$-$C_{20}$ alkyl group or a phenyl group.

In one or more embodiments, at least one of the m1 dopants (for example, each of the m1 dopants) may be an iridium-containing organometallic compound, and the iridium-containing organometallic compound may include at least one of a dibenzofuran group, a dibenzothiophene group, a dibenzoselenophene group, a dibenzosilole group, a dibenzogermole group, a naphthobenzofuran group, a naphthobenzothiophene group, a naphthobenzoselenophene group, a naphthobenzosilole group, a naphthobenzogermole group, a phenanthrobenzofuran group, a phenanthrobenzothiophene group, a phenanthrobenzoselenophene group, a phenanthrobenzosilole group, a phenanthrobenzogermole group, an azadibenzofuran group, an azadibenzothiophene group, an azadibenzoselenophene group, an azadibenzosilole group, an azadibenzogermole group, an azanaphthobenzofuran group, an azanaphthobenzothiophene group, an azanaphthobenzoselenophene group, an azanaphthobenzosilole group, an azanaphthobenzogermole group, an azaphenanthrobenzofuran group, an azaphenanthrobenzothiophene group, an azaphenanthrobenzoselenophene group, an azaphenanthrobenzosilole group, an azaphenanthrobenzogermole group, or a combination thereof, each of which may be linked to the iridium via C.

For example, the iridium-containing organometallic compound may include at least one of a dibenzofuran group, a dibenzothiophene group, a naphthobenzofuran group, a naphthobenzothiophene group, a phenanthrobenzofuran group, a phenanthrobenzothiophene group, an azadibenzofuran group, an azadibenzothiophene group, an azanaphthobenzofuran group, an azanaphthobenzothiophene group, an azaphenanthrobenzofuran group, an azaphenanthrobenzothiophene group, or a combination thereof, each of which may be linked to the iridium via C.

In one or more embodiments, at least one of the m1 dopants (for example, each of the m1 dopants) may be an iridium-containing organometallic compound, and the iridium-containing organometallic compound may include at least one of a benzimidazole group, a benzoxazole group, a benzthiazole group, a naphthoimidazole group, a naphthooxazole group, a naphthothiazole group, a phenanthroimidazole group, a phenanthrooxazole group, a phenanthrothiazole group, a pyridoimidazole group, a pyridooxazole group, a pyridothiazole group, a pyridine group, a pyrimidine group, a pyrazine group, a pyridazine group, a quinoline group, an isoquinoline group, or a combination thereof, each of which may be linked to the iridium via N.

For example, the iridium-containing organometallic compound may include at least one of a benzimidazole group, a naphthoimidazole group, a phenanthroimidazole group, or a combination thereof, each of which may be linked to the iridium via N.

In one or more embodiments, at least one of the m1 dopants (for example, each of the m1 dopants) may be an iridium-containing organometallic compound, and the iridium-containing organometallic compound may include ring $A_3$ which is linked to the iridium via N and ring $A_4$ which is linked to the iridium via C, wherein ring $A_3$ and ring $A_4$ are linked to each other through a single bond, ring $A_3$ may be a benzimidazole group, a benzoxazole group, a benzthiazole group, a naphthoimidazole group, a naphthooxazole group, a naphthothiazole group, a phenanthroimidazole group, a phenanthrooxazole group, a phenanthrothiazole group, a pyridoimidazole group, a pyridooxazole group, a pyridothiazole group, a pyridine group, a pyrimidine group, a pyrazine group, a pyridazine group, a quinoline group, or an isoquinoline group, and ring $A_4$ may be a dibenzofuran group, a dibenzothiophene group, a naphthobenzofuran group, a naphthobenzothiophene group, a phenanthrobenzofuran group, a phenanthrobenzothiophene group, an azadibenzofuran group, an azadibenzothiophene group, an azanaphthobenzofuran group, an azanaphthobenzothiophene group, an azaphenanthrobenzofuran group, or an azaphenanthrobenzothiophene group.

In one or more embodiments, the host having the largest value among the absolute values of the LUMO energy level of the m2 hosts may include a triazine group.

The composition as described herein may be used in an emission layer of an electronic device, for example, a light-emitting device. Thus, according to another aspect, provided is a light-emitting device including a first electrode; a second electrode opposing the first electrode; and an interlayer located between the first electrode and the second electrode, wherein the interlayer includes an emission layer, and wherein the emission layer includes a composition described herein.

In one or more embodiments, the emission layer may emit a green light.

For example, the maximum emission wavelength of the electroluminescence spectrum of the light emitted from the emission layer may be about 500 nm to about 580 nm, for example, about 510 nm to about 540 nm.

In one or more embodiments, the turn-off time of the light-emitting device including the composition as described herein may be about 100 microseconds (s) or less, or about 10 μs to about 100 μs, about 30 μs to about 95 μs, about 50 μs to about 90 μs, about 55 μs to about 85 μs, about 60 μs to about 80 μs, or about 64 μs to about 80 μs.

In one or more embodiments, the turn-on time of the light-emitting device including the composition as described herein may be about 300 μs or less, about 50 μs to about 300 μs, about 100 μs to about 270 μs, about 150 μs to about 260 μs, or about 180 μs to about 256 μs.

In the case of a light-emitting device having these ranges of the turn-off time and the turn-on time, the phenomenon in which a residual image is formed after the current is cut off and the color drag phenomenon after the current is applied can be substantially prevented.

The term "turn-off time" as used herein refers to a time required for a luminance of a light-emitting device to reach 10% of a maximum luminance after a current applied to the light-emitting device is stopped.

The term "turn-on time" as used herein refers to a time required for a luminance of a light-emitting device to reach 90% of a maximum luminance after applying a current to the light-emitting device.

In one or more embodiments, the interlayer of the light-emitting device may further include a hole transport region arranged between the first electrode and the emission layer, and an electron transport region arranged between the emission layer and the second electrode.

The hole transport region may include a hole injection layer, a hole transport layer, an electron blocking layer, a buffer layer, or a combination thereof, and the electron transport region may include a hole blocking layer, an electron transport layer, an electron injection layer, or a combination thereof.

The term "interlayer" as used herein refers to a single layer and/or a plurality of layers arranged between the first electrode and the second electrode of a light-emitting device. The "interlayer" may include not only organic compounds but also organometallic complexes including a metal.

In one or more embodiments, the interlayer may include m light-emitting units that each include at least one emission layer, and m−1 charge generation layers arranged between two neighboring light-emitting units of the m light-emitting units, m is an integer of 2 or greater, and an emission layer included in at least one light-emitting unit from among the m light-emitting units includes the composition described herein. That is, the light-emitting device may have a tandem structure in which a plurality of light-emitting units is vertically stacked between a first electrode and a second electrode. For example, m may be 2, 3, 4, 5, 6, 7, 8, 9, or 10. In one or more embodiments, m may be 2, 3, 4, 5, or 6.

Light emitted from the m light-emitting units may be identical to or different from each other.

In one or more embodiments, the light emitted from each of the m light-emitting units may be a green light.

In one or more embodiments, the light emitted from at least one light-emitting unit of m light-emitting units may be a green light, and the light emitted from at least one light-emitting unit of the remaining light-emitting units may be a blue light.

In one or more embodiments, the light-emitting device may further include a substrate including a red subpixel, a green subpixel, and a blue subpixel, the first electrode may be patterned for each of the red subpixel, the green subpixel, and the blue subpixel, and the emission layer may include a red emission layer corresponding to the red subpixel areas, a green emission layer corresponding to the green subpixel areas, and a blue emission layer corresponding to the blue subpixel areas, wherein the green emission layer may contain the composition described herein. That is, the light-emitting device may be a full-color light-emitting device.

In one or more embodiments, the area of the green subpixel of the interlayer of the light-emitting device may include:

m light-emitting units that may each include at least one emission layer, and m−1 charge generation layers that may be arranged between two neighboring light-emitting units of the m light-emitting units, wherein m is an integer of 2 or greater, and the emission layer included in at least one light-emitting unit of the m light-emitting units may be a green emission layer, and the green emission layer may include the composition as described herein.

In one or more embodiments, at least one of $|R_{turn\text{-}off}-G_{turn\text{-}off}|$ and $|B_{turn\text{-}off}-G_{turn\text{-}off}|$ (for example, all of $|R_{turn\text{-}off}-G_{turn\text{-}off}|$ and $|B_{turn\text{-}off}-G_{turn\text{-}off}|$) of the light-emitting device may be 100 about μs or less. In this regard, $R_{turn\text{-}off}$ is a time required for the luminance of a red light emitted from the red emission layer to reach 10% of a maximum luminance of the red light after the current is stopped (cut off) for the light-emitting device, $G_{turn\text{-}off}$ is a time required for a luminance of a green light emitted from the green emission layer to reach 10% of a maximum luminance of the green light after the current is stopped (cut off) for the light-emitting device, and $B_{turn\text{-}off}$ is a time required fora luminance of a blue light emitted from the blue emission layer to reach 10% of a maximum luminance of the blue light after the current is stopped (cut off) for the light-emitting device. Accordingly, a difference between a turn-off time for a red light and a turn-off time for a green light and/or a difference between a turn-off time for a blue light and a turn-off time for a green light in the light-emitting device may be substantially reduced, so that any residual image (e.g., a green residual image) that may be generated after the current is cut off or stopped for the light-emitting device may be substantially prevented.

In one or more embodiments, at least one of $|R_{turn\text{-}on}-G_{turn\text{-}on}|$ and $|B_{turn\text{-}on}-G_{turn\text{-}on}|$ (for example, all of $|R_{turn\text{-}on}-G_{turn\text{-}on}|$ and $|B_{turn\text{-}on}-G_{turn\text{-}on}|$) of the light-emitting device may be about 150 μs or less, for example, about 100 μs or less. In this regard, $R_{turn\text{-}on}$ is a time required for a luminance of a red light emitted from the red emission layer to reach 90% of a maximum luminance of the red light after application of the current to the light-emitting device, $G_{turn\text{-}on}$ is a time required for a luminance of a green light emitted from the green emission layer to reach 90% of a maximum luminance of the green light after application of the current to the light-emitting device, and $B_{turn\text{-}on}$ is a time required for a luminance of a blue light emitted from the blue emission layer to reach 90% of a maximum luminance of the blue light after application of the current to the light-emitting device. Accordingly, a difference between a turn-on time for a red light and a turn-on time for a green light and/or a difference between a turn-on time for a blue light and a turn-on time for a green light in the light-emitting device may be substantially reduced, so that the color drag phenomenon after application of the current to the light-emitting device may be substantially prevented.

Although not intended to be limited by a particular theory, generally, the turn-on time and the turn-off time for a green light in the full-color light-emitting device is relatively large compared to the turn-on time and the turn-off time for a red light and a blue light. Therefore, since the luminance of a red light and a blue light is increased faster than the luminance of a green light after the current is applied to the full-color light-emitting device, instead of the direct change from the black screen to the white screen over time (for example, seconds) after the current is applied, a black screen, a purple screen, and a white screen may be sequentially developed, that is, a purple color drag phenomenon may occur. Therefore, since the luminance of a red light and a blue light is reduced faster than the luminance of a green light after the current is cut off for the full-color light-emitting device, instead of the direct change from the white screen to the black screen over time (for example, seconds) after the current is cut off, a white screen, a green screen, and a black screen may be sequentially developed, that is, a green residual image may be formed. In this regard, since a green light has high visibility to the human eye, the control of turn-on time and turn-off time for a green light may have a direct effect on improving the overall image quality of light-emitting devices.

This issue can be addressed by using the composition having image-modifying coordinate represented by (X, Y) that exists inside a quadrangle with 4 vertices at (1.112, 0.119), (1.720, 0.119), (1.530, 0.160), and (1.112, 0.180), as described herein.

Although not intended to be limited by any particular theory, in general, the turn-off time for the emission of a red light and a blue light may be approximately about 100 s. Therefore, in the case of a full-color light-emitting device having a green emission layer including the composition as described herein, the turn-off time of a green light can be substantially similar to the turn-off time of each of a red light and a blue light. Accordingly, a residual image, for example, a green residual image after the current is cut off or stopped for the full-color light-emitting device can be substantially prevented.

In addition, although not intended to be limited by a particular theory, in general, the turn-on time for emission of a red light and a blue light may be approximately about 140 μs to about 200 μs. Therefore, in the case of a full-color light-emitting device having a green emission layer including the composition as described herein, the turn-on time of a green light can be substantially similar to the turn-on time of each of a red light and a blue light. Accordingly, the color drag phenomenon, for example, the purple color drag phenomenon after application of current to a full-color light-emitting device can be substantially prevented.

Therefore, a full-color light-emitting device using the composition described herein may provide a high-quality image without a residual image and color drag phenomenon even under various luminance and driving conditions (for example, low luminance, and high scan rate driving conditions, such as 120 hertz).

In one or more embodiments, the iridium-containing organometallic compound as described herein may be an organometallic compound represented by Formula 2:

$$M_2(L_{11})_{n11}(L_{12})_{n12}(L_{13})_{n13}. \qquad \text{Formula 2}$$

$M_2$ in Formula 2 may be iridium (Ir).

In Formula 2, $L_{11}$ may be a ligand represented by Formula 2-1, $L_{12}$ may be a ligand represented by Formula 2-2, and $L_{13}$ may be a ligand represented by Formula 2-1 or 2-2:

Formula 2-1

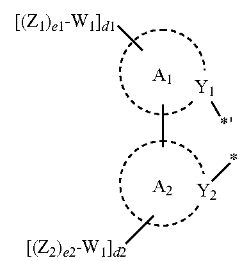

-continued

Formula 2-2

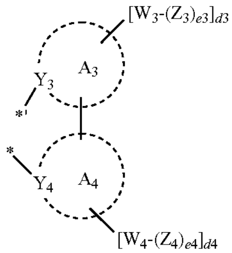

wherein Formulae 2-1 and 2-2 are as described herein. * and *' in Formulae 2-1 and 2-2 each indicate a binding site to $M_2$ in Formula 2.

In Formula 2, $L_{11}$ and $L_{12}$ may be different from each other.

In Formula 2, n11 to n13 indicate the number of $L_{11}$ to the number of $L_{13}$, respectively, and may each independently be 0, 1, 2, or 3, wherein n11+n12+n13 may be 3.

In one or more embodiments, in Formula 2, n11 may be 1, 2, or 3, and n12 and n13 may each independently be 0, 1, or 2.

In one or more embodiments, in Formula 2, n12 may be 1, 2, or 3, and n11 and n13 may each independently be 0, 1, or 2.

In one or more embodiments, n11 may be 1, n12 may be 2, and n13 may be 0.

In one or more embodiments, n11 may be 2, n12 may be 1, and n13 may be 0.

In one or more embodiments, n11 may be 3, and n12 and n13 may each be 0.

In one or more embodiments, n12 may be 3, and n11 and n13 may each be 0.

The organometallic compound represented by Formula 2 may be a heteroleptic complex or a homoleptic complex.

In one or more embodiments, the organometallic compound represented by Formula 2 may be a homoleptic complex. That is, the three ligands in the organometallic compound represented by Formula 2 may be identical to each other.

$Y_1$ to $Y_4$ in Formulae 2-1 and 2-2 may each independently be C or N.

In one or more embodiments, in Formulae 2-1 and 2-2, each of $Y_1$ and $Y_3$ may be N, and each of $Y_2$ and $Y_4$ may be C.

Ring $A_1$ to ring $A_4$ in Formulae 2-1 and 2-2 may each independently be a $C_5$-$C_{30}$ carbocyclic group or a $C_1$-$C_{30}$ heterocyclic group.

For example, ring $A_1$ to ring $A_4$ in Formulae 2-1 and 2-2 may each independently be i) a first ring, ii) a second ring, iii) a condensed ring group in which two or more first rings are condensed with each other, iv) a condensed ring group in which two or more second rings are condensed with each other, or v) condensed ring group in which at least one first ring is condensed with at least one second ring, wherein the first ring may be a cyclopentane group, a cyclopentene group, a furan group, a thiophene group, a pyrrole group, a silole group, a borole group, a phosphole group, a germole group, a selenophene group, an oxazole group, an oxadiazole group, an oxatriazole group, a thiazole group, a thiadiazole group, a thiatriazole group, a pyrazole group, an imidazole group, a triazole group, a tetrazole group, or an azasilole group, and the second ring may be an adamantane group, a norbornane group, a norbornene group, a cyclohexane group, a cyclohexene group, a benzene group, a pyridine group, a pyrimidine group, a pyrazine group, a pyridazine group, or a triazine group.

In one or more embodiments, ring $A_1$ to ring $A_4$ in Formulae 2-1 and 2-2 may each independently be a cyclopentane group, a cyclohexane group, a cyclohexene group, a benzene group, a naphthalene group, an anthracene group, a phenanthrene group, a triphenylene group, a pyrene group, a chrysene group, a 1,2,3,4-tetrahydronaphthalene group, a cyclopentadiene group, a pyrrole group, a furan group, a thiophene group, a silole group, a borole group, a phosphole group, a germole group, a selenophene group, an indene group, an indole group, a benzofuran group, a benzothiophene group, a benzosilole group, a benzoborole group, a benzophosphole group, a benzogermole group, a benzoselenophene group, a fluorene group, a carbazole group, a dibenzofuran group, a dibenzothiophene group, a dibenzosilole group, a dibenzoborole group, a dibenzophosphole group, a dibenzogermole group, a dibenzoselenophene group, a benzofluorene group, a benzocarbazole group, a naphthobenzofuran group, a naphthobenzothiophene group, a naphthobenzosilole group, a naphthobenzoborole group, a naphthobenzophosphole group, a naphthobenzogermole group, a naphthobenzoselenophene group, a dibenzofluorene group, a dibenzocarbazole group, a dinaphthofuran group, a dinaphthothiophene group, a dinaphthosilole group, a dinaphthoborole group, a dinaphthophosphole group, a dinaphthogermole group, a dinaphthoselenophene group, an indenophenanthrene group, an indolophenanthrene group, a phenanthrobenzofuran group, a phenanthrobenzothiophene group, a phenanthrobenzosilole group, a phenanthrobenzoborole group, a phenanthrobenzophosphole group, a phenanthrobenzogermole group, a phenanthrobenzoselenophene group, a dibenzothiophene 5-oxide group, a 9H-fluoren-9-one group, a dibenzothiophene 5,5-dioxide group, an azaindene group, an azaindole group, an azabenzofuran group, an azabenzothiophene group, an azabenzosilole group, an azabenzoborole group, an azabenzophosphole group, an azabenzogermole group, an azabenzoselenophene group, an azafluorene group, an azacarbazole group, an azadibenzofuran group, an azadibenzothiophene group, an azadibenzosilole group, an azadibenzoborole group, an azadibenzophosphole group, an azadibenzogermole group, an azadibenzoselenophene group, an azabenzofluorene group, an azabenzocarbazole group, an azanaphthobenzofuran group, an azanaphthobenzothiophene group, an azanaphthobenzosilole group, an azanaphthobenzoborole group, an azanaphthobenzophosphole group, an azanaphthobenzogermole group, an azanaphthobenzoselenophene group, an azadibenzofluorene group, an azadibenzocarbazole group, an azadinaphthofuran group, an azadinaphthothiophene group, an azadinaphthosilole group, an azadinaphthoborole group, an azadinaphthophosphole group, an azadinaphthogermole group, an azadinaphthoselenophene group, an azaindenophenanthrene group, an azaindolophenanthrene group, an azaphenanthrobenzofuran group, an azaphenanthrobenzothiophene group, an azaphenanthrobenzosilole group, an azaphenanthrobenzoborole group, an azaphenanthrobenzophosphole group, an azaphenanthrobenzogermole group, an azaphenanthrobenzoselenophene group, an azadibenzothiophene 5-oxide group, an aza9H-fluoren-9-one group, an azadibenzothiophene 5,5-dioxide group, a pyridine group, a pyrimidine group, a pyrazine group, a pyridazine group, a triazine group, a quinoline group, an isoquinoline group, a quinoxaline group, a quinazoline group, a benzoquinoline group, a benzoisoquinoline group, a benzoquinoxaline group, a benzoquinazoline group, a phenanthroline group, a phenanthridine group, a pyrrole group, a pyrazole group, an imidazole group, a triazole group, an oxazole group, an isoxazole group, a thiazole group, an isothiazole group, an oxadiazole group, a thiadiazole group, an azasilole group, an azaborole group, an azaphosphole group, an azagermole group, an azaselenophene group, a benzopyrrole group, a benzopyrazole group, a benzimidazole group, a benzoxazole group, a benzisoxazole group, a benzothiazole group, a benzisothiazole group, a benzoxadiazole group, a benzothiadiazole group, a pyridinopyrrole group, a pyridinopyrazole group, a pyridinoimidazole group, a pyridinooxazole group, a pyridinoisoxazole group, a pyridinothiazole group, a pyridinoisothiazole group, a pyridinooxadiazole group, a pyridinothiadiazole group, a pyrimidinopyrrole group, a pyrimidinopyrazole group, a pyrimidinoimidazole group, a pyrimidinooxazole group, a pyrimidinoisoxazole group, a pyrimidinothiazole group, a pyrimidinoisothiazole group, a pyrimidinooxadiazole group, a pyrimidinothiadiazole group, a naphthopyrrole group, a naphthopyrazole group, a naphthoimidazole group, a naphthooxazole group, a naphthoisoxazole group, a naphthothiazole group, a naphthoisothiazole group, a naphthooxadiazole group, a naphthothiadiazole group, a phenanthropyrrole group, a phenanthropyrazole group, a phenanthroimidazole group, a phenanthrooxazole group, a phenanthroisoxazole group, a phenanthrothiazole group, a phenanthroisothiazole group, a phenanthrooxadiazole group, a phenanthrothiadiazole group, a 5,6,7,8-tetrahydroisoquinoline group, a 5,6,7,8-tetrahydroquinoline group, an adamantane group, a norbornane group, a norbornene group, a benzene group with a cyclohexane group condensed thereto, a benzene group with a norbornane group condensed thereto, a pyridine group with a cyclohexane group condensed thereto, or a pyridine group with a norbornane group condensed thereto.

In Formulae 2-1 and 2-2, ring $A_1$ and ring $A_3$ may be identical to or different from each other.

In one or more embodiments, a $Y_1$-containing monocyclic group in ring $A_1$, a $Y_2$-containing monocyclic group in ring $A_2$, and $Y_4$-containing monocyclic group in ring $A_4$ may each independently be a 6-membered ring.

In one or more embodiments, a $Y_3$-containing monocyclic group in ring $A_3$ may be a 6-membered ring.

In one or more embodiments, a $Y_3$-containing monocyclic group in ring $A_3$ may be a 5-membered ring.

In one or more embodiments, a $Y_1$-containing monocyclic group in ring $A_1$ may be a 6-membered ring, and a $Y_3$-containing monocyclic group in ring $A_3$ may be a 5-membered ring.

In one or more embodiments, in Formulae 2-1 and 2-2, ring $A_1$ and ring $A_3$ may each independently be i) Group A, ii) a polycyclic ring group in which two or more Group A are condensed with each other, or iii) a polycyclic ring group in which at least one Group A and at least one Group B are condensed with each other,

- wherein Group A may include a pyridine group, a pyrimidine group, a pyridazine group, a pyrazine group, or a triazine group, and
- Group B may include a cyclohexane group, a cyclohexene group, a norbornane group, a benzene group, a furan group, a thiophene group, a selenophene group, a pyrrole group, a cyclopentadiene group, or silole group.

In one or more embodiments, in Formula 2-2, ring $A_3$ may be i) Group C, ii) a polycyclic ring group in which two or more Group C are condensed with each other, or iii) a polycyclic ring group in which at least one Group C and at least one Group D are condensed with each other,

- wherein Group C may include a pyrrole group, a pyrazole group, an imidazole group, a triazole group, an oxazole group, an isoxazole group, a thiazole group, or an isothiazole group, and
- Group D may include a cyclohexane group, a cyclohexene group, a norbornane group, a benzene group, a furan group, a thiophene group, a selenophene group, a cyclopentadiene group, a silole group, a pyridine group, a pyrimidine group, a pyridazine group, a pyrazine group, or a triazine group.

In one or more embodiments, ring $A_1$ in Formula 2-1 may be:

- a pyridine group, a pyrimidine group, a pyridazine group, or a pyrazine group; or
- a pyridine group, a pyrimidine group, a pyridazine group, or a pyrazine group, each condensed with at least one of a cyclohexane group, a norbornane group, a benzene group, or a combination thereof.

In one or more embodiments, ring $A_3$ in Formula 2-2 may be:

- a pyridine group, a pyrimidine group, a pyridazine group, or a pyrazine group;
- a pyridine group, a pyrimidine group, a pyridazine group, or a pyrazine group, each condensed with a cyclohexane group, a norbornane group, a benzene group, or a combination thereof; or
- an imidazole group, a benzimidazole group, a naphthoimidazole group, a phenanthroimidazole group, a pyridoimidazole group, an oxazole group, a benzoxazole group, a naphthooxazole group, a phenanthrooxazole group, a pyridooxazole group, a thiazole group, a benzothiazole group, a naphthothiazole group, a phenanthrothiazole group, or a pyridothiazole group.

In one or more embodiments, ring $A_2$ and ring $A_4$ in Formulae 2-1 and 2-2 may be different from each other.

In one or more embodiments, in Formulae 2-1 and 2-2, ring $A_2$ and ring $A_4$ may each independently be i) Group E, ii) a polycyclic ring group in which two or more of Group E are condensed with each other, or iii) a polycyclic ring group in which at least one of Group E and at least one of Group F are condensed with each other,

- wherein Group E may include a benzene group, a pyridine group, a pyrimidine group, a pyridazine group, a pyrazine group, or a triazine group, and
- Group F may include a furan group, a thiophene group, a selenophene group, a pyrrole group, a cyclopentadiene group, a silole group, a pyrazole group, an imidazole group, an oxazole group, a thiazole group, an isoxazole group, or an isothiazole group.

In one or more embodiments, in Formula 2-1, ring $A_2$ may be a polycyclic ring group in which two or more Group E and at least one Group F are condensed with each other.

In one or more embodiments, in Formula 2-2, ring $A_4$ may be a polycyclic ring group in which two or more Group E and at least one Group F are condensed with each other.

In one or more embodiments, ring $A_2$ in Formula 2-1 may be:

- a benzene group, a naphthalene group, a phenanthrene group, a dibenzofuran group, a dibenzothiophene group, a dibenzoselenophene group, a carbazole group, a fluorene group, or a dibenzosilole group; or
- a benzene group, a naphthalene group, a phenanthrene group, a dibenzofuran group, a dibenzothiophene group, a dibenzoselenophene group, a carbazole group, a fluorene group, or a dibenzosilole group, each condensed with at least one of a cyclohexane group, a norbornane group, a benzene group, or a combination thereof.

In one or more embodiments, ring $A_4$ in Formula 2-2 may be:

a benzene group, a naphthalene group, a phenanthrene group, a dibenzofuran group, a dibenzothiophene group, a dibenzoselenophene group, a carbazole group, a fluorene group, a dibenzosilole group, an azadibenzofuran group, an azadibenzothiophene group, an azadibenzoselenophene group, an azacarbazole group, an azafluorene group, or an azadibenzosilole group; or a benzene group, a naphthalene group, a phenanthrene group, a dibenzofuran group, a dibenzothiophene group, a dibenzoselenophene group, a carbazole group, a fluorene group, a dibenzosilole group, an azadibenzofuran group, an azadibenzothiophene group, an azadibenzoselenophene group, an azacarbazole group, an azafluorene group, or an azadibenzosilole group, each condensed with at least one of a benzene group, a pyridine group, a pyrimidine group, a pyridazine group, a pyrazine group, a cyclohexane group, a norbornane group, a furan group, a thiophene group, a selenophene group, a pyrrole group, a cyclopentadiene group, a silole group, a pyrazole group, an imidazole group, an oxazole group, a thiazole group, an isoxazole group, an isothiazole group, or a combination thereof.

In one or more embodiments, ring $A_4$ in Formula 2-2 may be a dibenzofuran group, a dibenzothiophene group, a dibenzoselenophene group, a dibenzosilole group, a dibenzogermole group, a naphthobenzofuran group, a naphthobenzothiophene group, a naphthobenzoselenophene group, a naphthobenzosilole group, a naphthobenzogermole group, a phenanthrobenzofuran group, a phenanthrobenzothiophene group, a phenanthrobenzoselenophene group, a phenanthrobenzosilole group, a phenanthrobenzogermole group, an azadibenzofuran group, an azadibenzothiophene group, an azadibenzoselenophene group, an azadibenzosilole group, an azadibenzogermole group, an azanaphthobenzofuran group, an azanaphthobenzothiophene group, an azanaphthobenzoselenophene group, an azanaphthobenzosilole group, an azanaphthobenzogermole group, an azaphenanthrobenzofuran group, an azaphenanthrobenzothiophene group, an azaphenanthrobenzoselenophene group, an azaphenanthrobenzosilole group, or an azaphenanthrobenzogermole group.

$W_1$ to $W_4$ in Formulae 2-1 and 2-2 may each independently be a single bond, a $C_1$-$C_{20}$alkylene group that is unsubstituted or substituted with at least one $R_{10a}$, a $C_5$-$C_{30}$ carbocyclic group that is unsubstituted or substituted with at least one $R_{10a}$, or a $C_1$-$C_{30}$ heterocyclic group that is unsubstituted or substituted with at least one $R_{10a}$.

For example, $W_1$ to $W_4$ in Formulae 2-1 and 2-2 may each independently be:

a single bond, or a cyclopentene group, a cyclohexane group, a cyclohexene group, a benzene group, a naphthalene group, an anthracene group, a phenanthrene group, a triphenylene group, a pyrene group, a chrysene group, a cyclopentadiene group, a 1,2,3,4-tetrahydronaphthalene group, a thiophene group, a furan group, an indole group, a benzoborole group, a benzophosphole group, an indene group, a benzosilole group, a benzogermole group, a benzothiophene group, a benzoselenophene group, a benzofuran group, a carbazole group, a dibenzoborole group, a dibenzophosphole group, a fluorene group, a dibenzosilole group, a dibenzogermole group, a dibenzothiophene group, a dibenzoselenophene group, a dibenzofuran group, a dibenzothiophene 5-oxide group, a 9H-fluorene-9-one group, a dibenzothiophene 5,5-dioxide group, an azaindole group, an azabenzoborole group, an azabenzophosphole group, an azaindene group, an azabenzosilole group, an azabenzogermole group, an azabenzothiophene group, an azabenzoselenophene group, an azabenzofuran group, an azacarbazole group, an azadibenzoborole group, an azadibenzophosphole group, an azafluorene group, an azadibenzosilole group, an azadibenzogermole group, an azadibenzothiophene group, an azadibenzoselenophene group, an azadibenzofuran group, an azadibenzothiophene 5-oxide group, an aza-9H-fluorene-9-one group, an azadibenzothiophene 5,5-dioxide group, a pyridine group, a pyrimidine group, a pyrazine group, a pyridazine group, a triazine group, a quinoline group, an isoquinoline group, a quinoxaline group, a quinazoline group, a phenanthroline group, a pyrrole group, a pyrazole group, an imidazole group, a triazole group, an oxazole group, an iso-oxazole group, a thiazole group, an isothiazole group, an oxadiazole group, a thiadiazole group, a benzopyrazole group, a benzimidazole group, a benzoxazole group, a benzothiazole group, a benzoxadiazole group, a benzothiadiazole group, a 5,6,7,8-tetrahydroisoquinoline group, a 5,6,7,8-tetrahydroquinoline group, an adamantane group, a norbornane group, or a norbornene group, each unsubstituted or substituted with at least one $R_{10a}$.

In one or more embodiments, $W_1$ to $W_4$ in Formulae 2-1 and 2-2 may each independently be:

a single bond; or a benzene group, a naphthalene group, a pyridine group, a fluorene group, a carbazole group, a dibenzofuran group, or a dibenzothiophene group, each unsubstituted or substituted with at least one $R_{10a}$.

In one or more embodiments, $W_1$ to $W_4$ in Formulae 2-1 and 2-2 may each independently be:

a single bond; or a $C_1$-$C_{20}$ alkylene group, a benzene group, a naphthalene group, a dibenzofuran group, or a dibenzothiophene group, each unsubstituted or substituted with at least one of deuterium, —F, a cyano group, a $C_1$-$C_{20}$ alkyl group, a deuterated $C_1$-$C_{20}$ alkyl group, a fluorinated $C_1$-$C_{20}$ alkyl group, a $C_3$-$C_{10}$ cycloalkyl group, a deuterated $C_3$-$C_{10}$ cycloalkyl group, a fluorinated $C_3$-$C_{10}$ cycloalkyl group, a ($C_1$-$C_{20}$ alkyl)$C_3$-$C_{10}$ cycloalkyl group, a phenyl group, a deuterated phenyl group, a fluorinated phenyl group, a ($C_1$-$C_{20}$ alkyl)phenyl group, a naphthyl group, a pyridinyl group, a furanyl group, a thiophenyl group, a benzofuranyl group, a benzothiophenyl group, a dibenzofuranyl group, a dibenzothiophenyl group, or a combination thereof.

$Z_1$ to $Z_4$ in Formulae 2-1 and 2-2 may each independently be hydrogen, deuterium, —F, —Cl, —Br, —I, —$SF_5$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_1$-$C_{60}$ alkylthio group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_7$-$C_{60}$ alkyl aryl group, a substituted or unsubstituted $C_7$-$C_{60}$ aryl alkyl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted $C_2$-$C_{60}$ alkyl heteroaryl group, a substituted or unsubstituted $C_2$-$C_{60}$ heteroaryl alkyl group, a substituted or unsubstituted $C_1$-$C_{60}$ heteroaryloxy group, a substituted or unsubstituted $C_1$-$C_{60}$ heteroarylthio group, a substituted or unsubstituted monovalent non-aromatic condensed polycyclic group, a substituted or unsubstituted monovalent non-aromatic condensed heteropolycyclic group, —N($Q_1$)($Q_2$), —Si($Q_3$)($Q_4$)($Q_5$), —Ge($Q_3$)($Q_4$)($Q_5$), —B($Q_6$)($Q_7$), —P(═O)($Q_8$)($Q_9$), or —P($Q_8$)($Q_9$). $Q_1$ to $Q_9$ may each be as described herein.

For example, $Z_1$ to $Z_4$ in Formulae 2-1 and 2-2 may each independently be:

- hydrogen, deuterium, —F, —Cl, —Br, —I, —$SF_5$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, $C_1$-$C_{20}$ alkyl group, a $C_2$-$C_{20}$ alkenyl group, a $C_1$-$C_{20}$ alkoxy group, or a $C_1$-$C_{20}$ alkylthio group;
- a $C_1$-$C_{20}$ alkyl group, a $C_2$-$C_{20}$ alkenyl group, a $C_1$-$C_{20}$ alkoxy group, or a $C_1$-$C_{20}$ alkylthio group, each substituted with at least one of deuterium, —F, —Cl, —Br, —I, —$SF_5$, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{10}$ alkyl group, a cyclopentyl group, a cyclohexyl group, a cycloheptyl group, a cyclooctyl group, an adamantanyl group, a norbornanyl group (or a bicyclo[2.2.1]heptyl group), a norbornenyl group, a cyclopentenyl group, a cyclohexenyl group, a cycloheptenyl group, a bicyclo[1.1.1]pentyl group, a bicyclo[2.1.1]hexyl group, a bicyclo[2.2.2]octyl group, a ($C_1$-$C_{20}$ alkyl)cyclopentyl group, a ($C_1$-$C_{20}$ alkyl)cyclohexyl group, a ($C_1$-$C_{20}$ alkyl)cycloheptyl group, a ($C_1$-$C_{20}$ alkyl)cyclooctyl group, a ($C_1$-$C_{20}$ alkyl)adamantanyl group, a ($C_1$-$C_{20}$ alkyl)norbornanyl group, a ($C_1$-$C_{20}$ alkyl)norbornenyl group, a ($C_1$-$C_{20}$ alkyl)cyclopentenyl group, a ($C_1$-$C_{20}$ alkyl)cyclohexenyl group, a ($C_1$-$C_{20}$ alkyl)cycloheptenyl group, a ($C_1$-$C_{20}$ alkyl)bicyclo[1.1.1]pentyl group, a ($C_1$-$C_{20}$ alkyl)bicyclo[2.1.1]hexyl group, a ($C_1$-$C_{20}$ alkyl)bicyclo[2.2.2]octyl group, a phenyl group, a ($C_1$-$C_{20}$ alkyl)phenyl group, a biphenyl group, a terphenyl group, a naphthyl group, a pyridinyl group, a pyrimidinyl group, or a combination thereof,
- a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a bicyclo[1.1.1]pentyl group, a bicyclo[2.1.1]hexyl group, a bicyclo[2.2.2]octyl group, a phenyl group, a ($C_1$-$C_{20}$ alkyl)phenyl group, a biphenyl group, a terphenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, a benzoisothiazolyl group, a benzoxazolyl group, a benzoisoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, an imidazopyrimidinyl group, an azacarbazolyl group, an azadibenzofuranyl group, or an azadibenzothiophenyl group, each unsubstituted or substituted with at least one of deuterium, —F, —Cl, —Br, —I, —$SF_5$, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a deuterated $C_1$-$C_{20}$ alkyl group, a fluorinated $C_1$-$C_{20}$ alkyl group, a $C_1$-$C_{20}$ alkoxy group, a $C_1$-$C_{20}$ alkylthio group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a bicyclo[1.1.1]pentyl group, a bicyclo[2.1.1]hexyl group, a bicyclo[2.2.2]octyl group, a ($C_1$-$C_{20}$ alkyl)cyclopentyl group, a ($C_1$-$C_{20}$ alkyl)cyclohexyl group, a ($C_1$-$C_{20}$ alkyl)cycloheptyl group, a ($C_1$-$C_{20}$ alkyl)cyclooctyl group, a ($C_1$-$C_{20}$ alkyl)adamantanyl group, a ($C_1$-$C_{20}$ alkyl)norbornanyl group, a ($C_1$-$C_{20}$ alkyl)norbornenyl group, a ($C_1$-$C_{20}$ alkyl)cyclopentenyl group, a ($C_1$-$C_{20}$ alkyl)cyclohexenyl group, a ($C_1$-$C_{20}$ alkyl)cycloheptenyl group, a ($C_1$-$C_{20}$ alkyl)bicyclo[1.1.1]pentyl group, a ($C_1$-$C_{20}$ alkyl)bicyclo[2.1.1]hexyl group, a ($C_1$-$C_{20}$ alkyl)bicyclo[2.2.2]octyl group, a phenyl group, a ($C_1$-$C_{20}$ alkyl)phenyl group, a deuterated phenyl group, a fluorinated phenyl group, a biphenyl group, a terphenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, a benzoisothiazolyl group, a benzoxazolyl group, a benzoisoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, an imidazopyrimidinyl group, an azacarbazolyl group, an azadibenzofuranyl group, an azadibenzothiophenyl group, or a combination thereof; or $N(Q_1)(Q_2)$, —$Si(Q_3)(Q_4)(Q_5)$, —$Ge(Q_3)(Q_4)(Q_5)$, —$B(Q_6)(Q_7)$, —$P(=O)(Q_8)(Q_9)$, or —$P(Q_8)(Q_9)$, wherein $Q_1$ to $Q_9$ may each independently be:

deuterium, —F, —$CH_3$, —$CD_3$, —$CD_2H$, —$CDH_2$, —$CH_2CH_3$, —$CH_2CD_3$, —$CH_2CD_2H$, —$CH_2CDH_2$, —$CHDCH_3$, —$CHDCD_2H$, —$CHDCDH_2$, —$CHDCD_3$, —$CD_2CD_3$, —$CD_2CD_2H$, —$CD_2CDH_2$, —$CF_3$, —$CF_2H$, —$CFH_2$, —$CH_2CF_3$, —$CH_2CF_2H$, —$CH_2CFH_2$, —$CHFCH_3$, —$CHFCF_2H$, —$CHFCFH_2$, —$CHFCF_3$, —$CF_2CF_3$, —$CF_2CF_2H$, or —$CF_2CFH_2$; or an n-propyl group, an isopropyl group, an n-butyl group, a sec-butyl group, an isobutyl group, a tert-butyl group, an n-pentyl group, a tert-pentyl group, a neopentyl group, an isopentyl group, a sec-pentyl group, a 3-pentyl group, a sec-isopentyl group, a phenyl group, a biphenyl group, or a naphthyl group, each unsubstituted or substituted with at least one of deuterium, —F, a $C_1$-$C_{10}$ alkyl group, a phenyl group, or a combination thereof.

In one or more embodiments, $Z_1$ to $Z_4$ in Formulae 2-1 and 2-2 may each independently be:

hydrogen, deuterium, —F, or a cyano group;

a $C_1$-$C_{20}$ alkyl group unsubstituted or substituted with at least one of deuterium, —F, a cyano group, a $C_3$-$C_{10}$ cycloalkyl group, a deuterated $C_3$-$C_{10}$ cycloalkyl group, a fluorinated $C_3$-$C_{10}$ cycloalkyl group, a ($C_1$-$C_{20}$ alkyl)$C_3$-$C_{10}$ cycloalkyl group, a $C_1$-$C_{10}$ heterocycloalkyl group, a deuterated $C_1$-$C_{10}$ heterocycloalkyl group, a fluorinated $C_1$-$C_{10}$ heterocycloalkyl group, a ($C_1$-$C_{20}$ alkyl)$C_1$-$C_{10}$ heterocycloalkyl group, a phenyl group, a deuterated phenyl group, a fluorinated phenyl group, a ($C_1$-$C_{20}$ alkyl)phenyl group, a biphenyl group, a deuterated biphenyl group, a fluorinated biphenyl group, a ($C_1$-$C_{20}$ alkyl)biphenyl group, a dibenzofuranyl group, a deuterated dibenzofuranyl group, a fluorinated dibenzofuranyl group, a ($C_1$-$C_{20}$ alkyl)dibenzofuranyl group, a dibenzothiophenyl group, a deuterated dibenzothiophenyl group, a fluorinated dibenzothiophenyl group, a ($C_1$-$C_{20}$ alkyl)dibenzothiophenyl group, or a combination thereof;

a $C_3$-$C_{10}$ cycloalkyl group, a $C_1$-$C_{10}$ heterocycloalkyl group, a phenyl group, a biphenyl group, a naphthyl group, a pyridinyl group, a fluorenyl group, a carbazolyl group, a dibenzofuranyl, or a dibenzothiophenyl group, each unsubstituted or substituted with at least one of deuterium, —F, a cyano group, a $C_1$-$C_{20}$ alkyl group, a deuterated $C_1$-$C_{20}$ alkyl group, fluorinated $C_1$-$C_{20}$ alkyl group, a $C_1$-$C_{20}$ alkoxy group, a $C_1$-$C_{20}$ alkylthio group, a deuterated $C_1$-$C_{20}$ alkoxy group, a fluorinated $C_1$-$C_{20}$ alkoxy group, a $C_3$-$C_{10}$ cycloalkyl group, a deuterated $C_3$-$C_{10}$ cycloalkyl group, a fluorinated $C_3$-$C_{10}$ cycloalkyl group, a ($C_1$-$C_{20}$ alkyl)$C_3$-$C_{10}$ cycloalkyl group, a $C_1$-$C_{10}$ heterocycloalkyl group, a deuterated $C_1$-$C_{10}$ heterocycloalkyl group, a fluorinated $C_1$-$C_{10}$ heterocycloalkyl group, a ($C_1$-$C_{20}$ alkyl)$C_1$-$C_{10}$ heterocycloalkyl group, a phenyl group, a deuterated phenyl group, a fluorinated phenyl group, a ($C_1$-$C_{20}$ alkyl)phenyl group, a biphenyl group, a deuterated biphenyl group, a fluorinated biphenyl group, a ($C_1$-$C_{20}$ alkyl)biphenyl group, a dibenzofuranyl group, a deuterated dibenzofuranyl group, a fluorinated dibenzofuranyl group, a ($C_1$-$C_{20}$ alkyl)dibenzofuranyl group, a dibenzothiophenyl group, a deuterated dibenzothiophenyl group, a fluorinated dibenzothiophenyl group, a ($C_1$-$C_{20}$ alkyl)dibenzothiophenyl group, or a combination thereof; or —$Si(Q_3)(Q_4)(Q_5)$ or —$Ge(Q_3)(Q_4)(Q_5)$.

In one or more embodiments, in Formula 2-1, each of e1 and d1 may not be 0, and at least one of a plurality of $Z_1$ may be a deuterated $C_1$-$C_{20}$ alkyl group, —$Si(Q_3)(Q_4)(Q_5)$, or —$Ge(Q_3)(Q_4)(Q_5)$. $Q_3$ to $Q_5$ are as described herein.

For example, $Q_3$ to $Q_5$ may each independently be:

a $C_1$-$C_{60}$ alkyl group unsubstituted or substituted with at least one of deuterium, a $C_1$-$C_{60}$ alkyl group, a $C_6$-$C_{60}$ aryl group, or a combination thereof; or a $C_6$-$C_{60}$ aryl group unsubstituted or substituted with at least one of deuterium, a $C_1$-$C_{60}$ alkyl group, a $C_6$-$C_{60}$ aryl group, or a combination thereof.

In one or more embodiments, $Q_3$ to $Q_5$ may each independently be:

—$CH_3$, —$CD_3$, —$CD_2H$, —$CDH_2$, —$CH_2CH_3$, —$CH_2CD_3$, —$CH_2CD_2H$, —$CH_2CDH_2$, —$CHDCH_3$, —$CHDCD_2H$, —$CHDCDH_2$, —$CHDCD_3$, —$CD_2CD_3$, —$CD_2CD_2H$, or —$CD_2CDH_2$; or an n-propyl group, an isopropyl group, an n-butyl group, a sec-butyl group, an isobutyl group, a tert-butyl group, an n-pentyl group, a tert-pentyl group, a neopentyl group, an isopentyl group, a sec-pentyl group, a 3-pentyl group, a sec-isopentyl group, a phenyl group, a biphenyl group, or a naphthyl group, each unsubstituted or substituted with at least one of deuterium, a $C_1$-$C_{10}$ alkyl group, a phenyl group, or a combination thereof.

In one or more embodiments, $Q_3$ to $Q_5$ may be identical to each other.

In one or more embodiments, two or more of $Q_3$ to $Q_5$ may be different from each other.

In one or more embodiments, the organometallic compound represented by Formula 2 may satisfy at least one of Condition (1) to Condition (9):

Condition (1)

each of e1 and d1 in Formula 2-1 is not 0, and at least one $Z_1$ includes deuterium;

Condition (2)

each of e2 and d2 in Formula 2-1 is not 0, and at least one $Z_2$ includes deuterium;

Condition (3)

each of e3 and d3 in Formula 2-2 is not 0, and at least one $Z_3$ includes deuterium;

Condition (4)

each of e4 and d4 in Formula 2-2 is not 0, and at least one $Z_4$ includes deuterium;

Condition (5)

each of e1 and d1 in Formula 2-1 is not 0, and at least one $Z_1$ includes a fluoro group;

Condition (6)

each of e2 and d2 in Formula 2-1 is not 0, and at least one $Z_2$ includes a fluoro group;

Condition (7)

each of e3 and d3 in Formula 2-2 is not 0, and at least one $Z_3$ includes a fluoro group;

Condition (8)

each of e4 and d4 in Formula 2-2 is not 0, and at least one $Z_4$ includes a fluoro group;

Condition (9)

each of n11 and n13 in Formula 2 is 0, n12 in Formula 2 is 3, three $L_{12}$ in Formula 2 are identical to each other, $Y_3$ in Formula 2-2 is nitrogen, $Y_4$ in Formula 2-2 is carbon, ring $A_3$ in Formula 2-2 is a benzimidazole group, a benzoxazole group, a benzthiazole group, a naphthoimidazole group, a naphthooxazole group, a naphthothiazole group, a phenanthroimidazole group, a phenanthrooxazole group, a phenanthrothiazole group, a pyridoimidazole group, a pyridooxazole group, or a pyridothiazole group, and ring $A_4$ in Formula 2-2 is a dibenzofuran group, a dibenzothiophene group, a dibenzoselenophene group, a dibenzosilole group, a dibenzogermole group, a naphthobenzofuran group, a naphthobenzothiophene group, a naphthobenzoselenophene group, a naphthobenzosilole group, a naphthobenzogermole group, a phenanthrobenzofuran group, a phenanthrobenzothiophene group, a phenanthrobenzoselenophene group, a phenanthrobenzosilole group, a phenanthrobenzogermole group, an azadibenzofuran group, an azadibenzothiophene group, an azadibenzoselenophene group, an azadibenzosilole group, an azadibenzogermole group, an azanaphthobenzofuran group, an azanaphthobenzothiophene group, an azanaphthobenzoselenophene group, an azanaphthobenzosilole group, an azanaphthobenzogermole group, an azaphenanthrobenzofuran group, an azaphenanthrobenzothiophene group, an azaphenanthrobenzoselenophene group, an azaphenanthrobenzosilole group, or an azaphenanthrobenzogermole group.

In one or more embodiments, $Z_1$ to $Z_4$ in Formulae 2-1 and 2-2 may each independently be hydrogen, deuterium, —F, —$CH_3$, —$CD_3$, —$CD_2H$, —$CDH_2$, —$CF_3$, —$CF_2H$, —$CFH_2$, a $C_2$-$C_{10}$alkenyl group, a $C_1$-$C_{10}$alkoxy group, a $C_1$-$C_{10}$alkylthio group, a group represented by one of Formulae 9-1 to 9-39, a group represented by one of Formulae 9-1 to 9-39 in which at least one hydrogen is substituted with deuterium, a group represented by one of Formulae 9-1 to 9-39 in which at least one hydrogen is substituted with —F, a group represented by one of Formulae 9-201 to 9-227, a group represented by one of Formulae 9-201 to 9-227 in which at least one hydrogen is substituted with deuterium, a group represented by one of Formulae 9-201 to 9-227 in which at least one hydrogen is substituted with —F, a group represented by one of Formulae 10-1 to 10-129, a group represented by one of Formulae 10-1 to 10-129 in which at least one hydrogen is substituted with deuterium, a group represented by one of Formulae 10-1 to 10-129 in which at least one hydrogen is substituted with —F, a group represented by one of Formulae 10-201 to 10-350, a group represented by one of Formulae 10-201 to 10-350 in which at least one hydrogen is substituted with deuterium, a group represented by one of Formulae 10-201 to 10-350 in which at least one hydrogen is substituted with —F, —$Si(Q_3)(Q_4)(Q_5)$, or —$Ge(Q_3)(Q_4)(Q_5)$, wherein $Q_3$ to $Q_5$ are each as described herein.

9-1

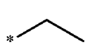

9-2

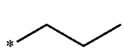

9-3

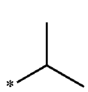

9-4

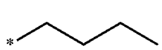

9-5

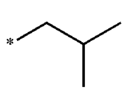

-continued 9-6

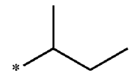

9-7

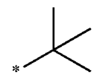

9-8

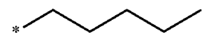

9-9

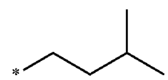

9-10

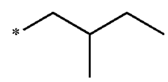

9-11

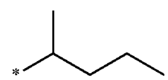

9-12

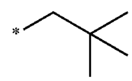

9-13

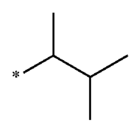

9-14

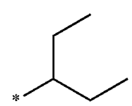

9-15

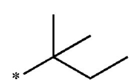

9-16

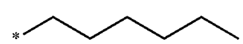

9-17

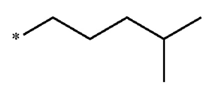

9-18

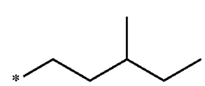

9-19

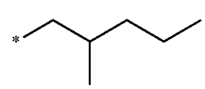

9-20

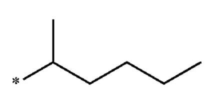

9-21

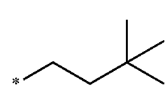

9-22

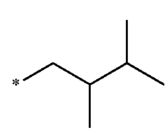

-continued
9-23
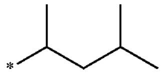
9-24
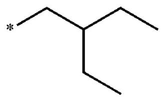
9-25
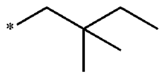
9-26
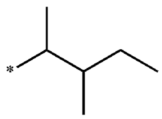
9-27
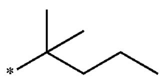
9-28
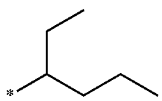
9-29
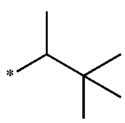
9-30
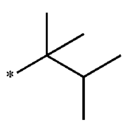
9-31
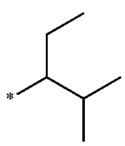
9-32
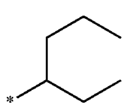
9-33
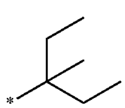
9-34
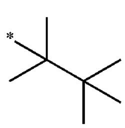
9-35
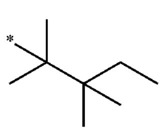
-continued
9-36
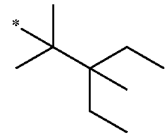
9-37
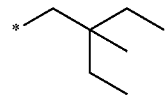
9-38
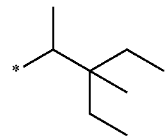
9-39
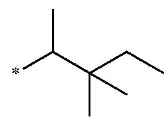
9-201
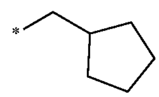
9-202
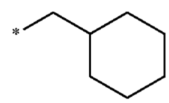
9-203
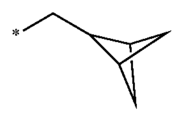
9-204
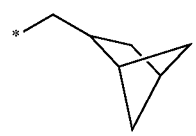
9-205
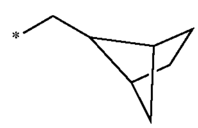
9-206
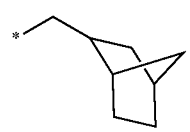
9-207
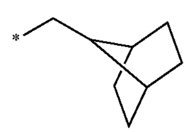
9-208
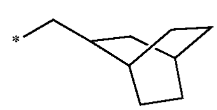

-continued
9-209
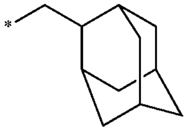
9-210
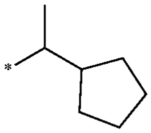
9-211
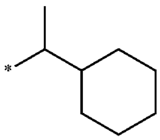
9-212
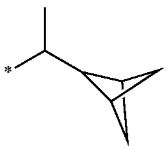
9-213
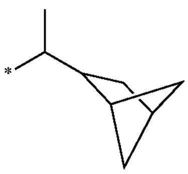
9-214
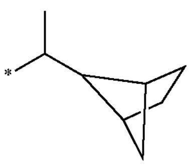
9-215
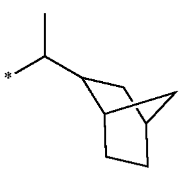
9-216
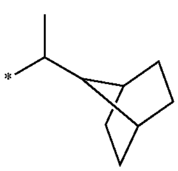
9-217
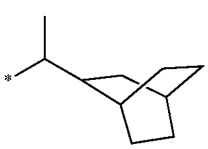
9-218
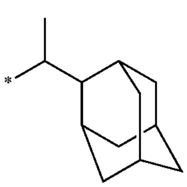
-continued
9-219
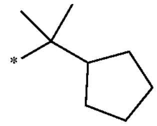
9-220
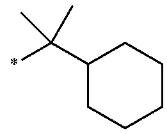
9-221
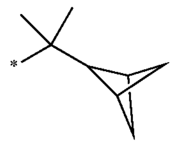
9-222
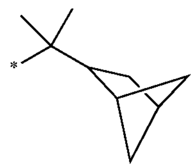
9-223
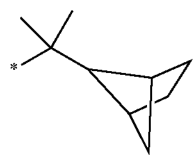
9-224
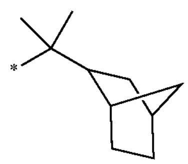
9-225
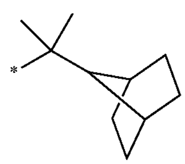
9-226
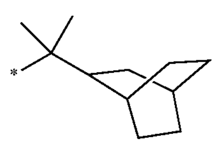
9-227
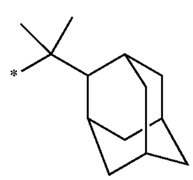
10-1
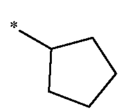

-continued
10-2
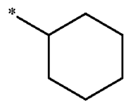
10-3
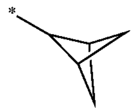
10-4
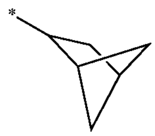
10-5
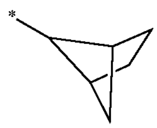
10-6
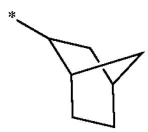
10-7
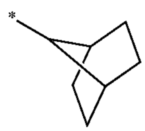
10-8
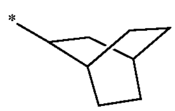
10-9
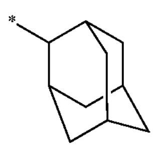
10-10
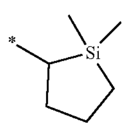
10-11
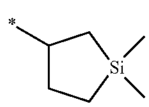
10-12
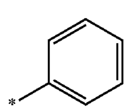
10-13
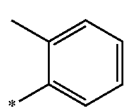
-continued
10-14
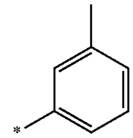
10-15
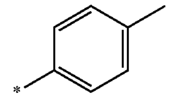
10-16
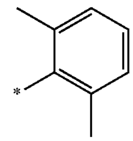
10-17
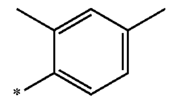
10-18
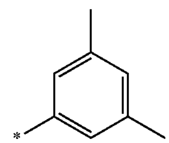
10-19
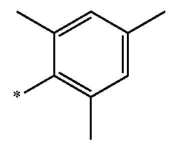
10-20
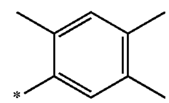
10-21
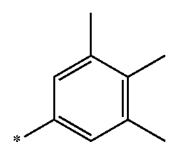
10-22
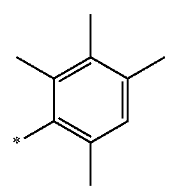
10-23
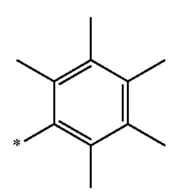
10-24
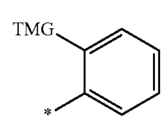

-continued
10-25
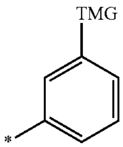
10-26
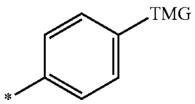
10-27
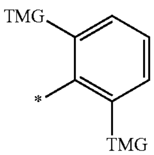
10-28
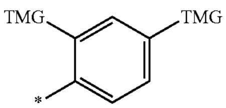
10-29
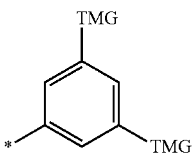
10-30
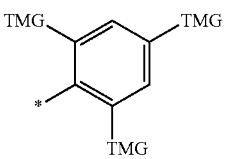
10-31
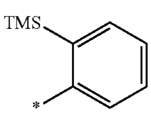
10-32
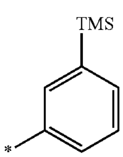
10-33
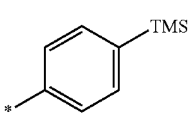
10-34
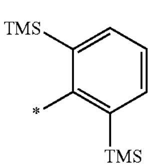
10-35
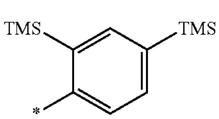
-continued
10-36
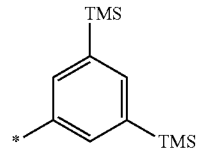
10-37
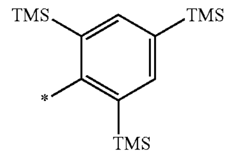
10-38
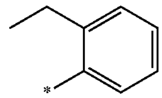
10-39
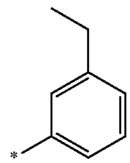
10-40
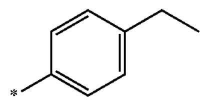
10-41
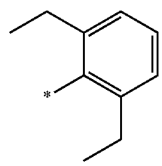
10-42
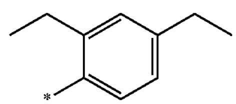
10-43
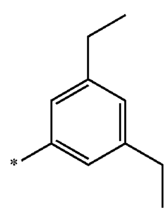
10-44
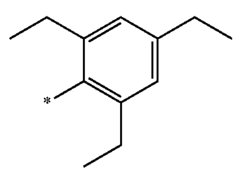
10-45
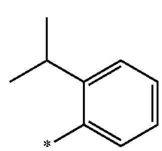

-continued
10-46
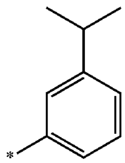
10-47
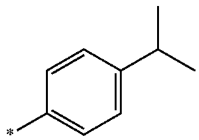
10-48
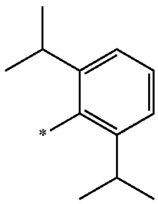
10-49
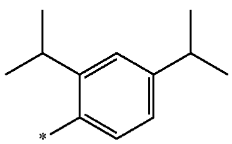
10-50
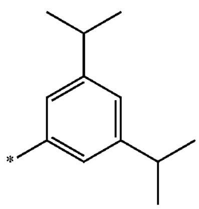
10-51
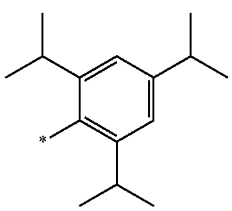
10-52
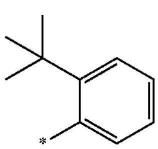
10-53
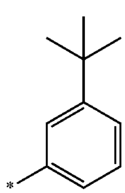
10-54
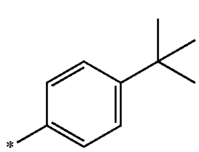
-continued
10-55
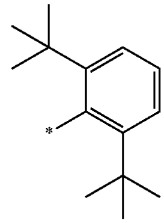
10-56
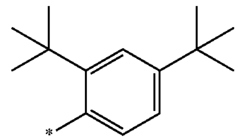
10-57
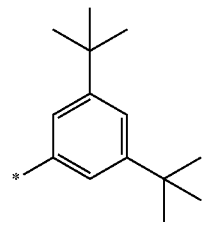
10-58
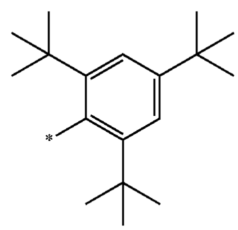
10-59
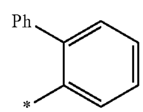
10-60
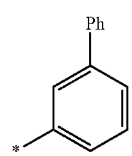
10-61
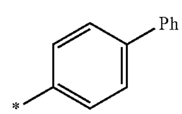
10-62
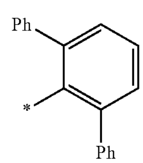
10-63
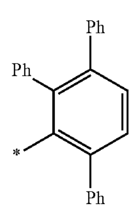

-continued
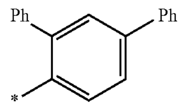
10-64
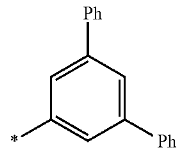
10-65
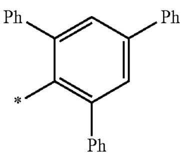
10-66
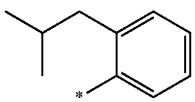
10-67
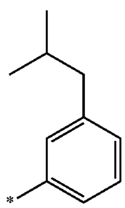
10-68
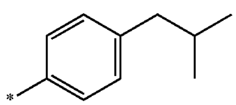
10-69
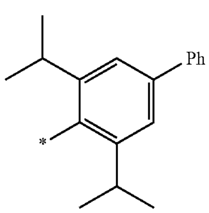
10-70
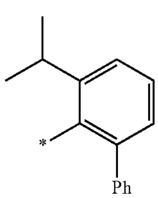
10-71
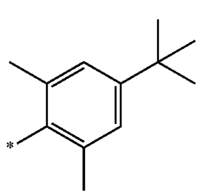
10-72
-continued
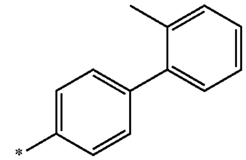
10-73
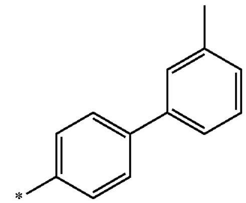
10-74
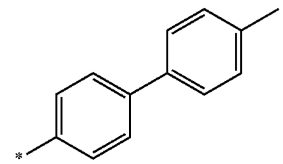
10-75
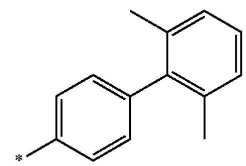
10-76
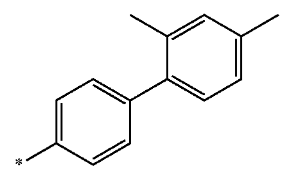
10-77
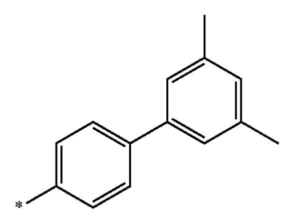
10-78
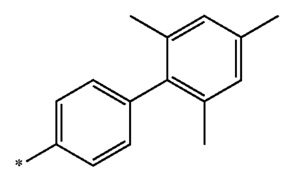
10-79
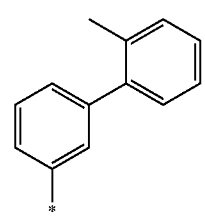
10-80

-continued
10-81
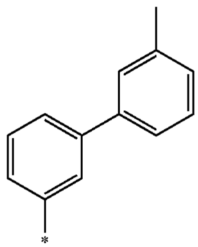
10-82
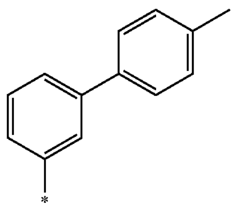
10-83
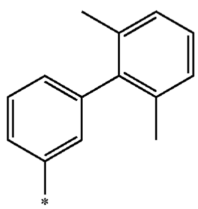
10-84
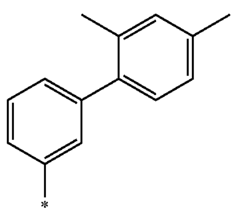
10-85
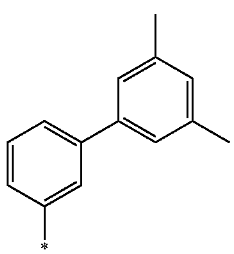
10-86
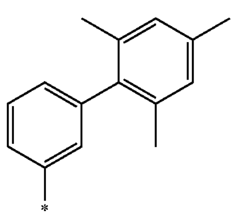
10-87
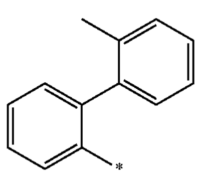
-continued
10-88
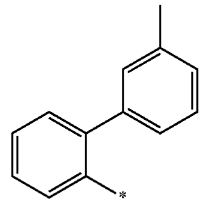
10-89
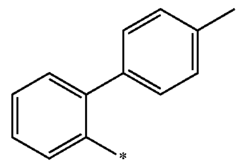
10-90
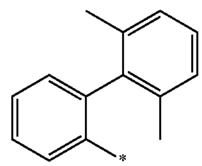
10-91
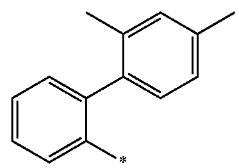
10-92
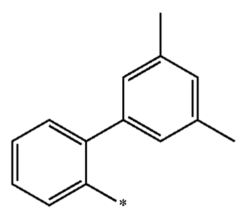
10-93
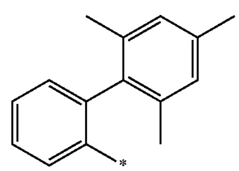
10-94
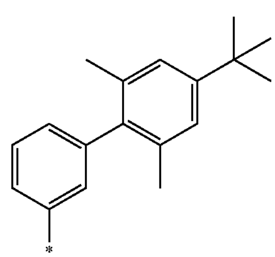
10-95
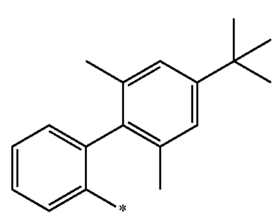

-continued
10-96
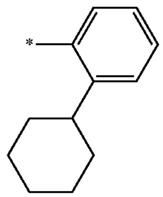
10-97
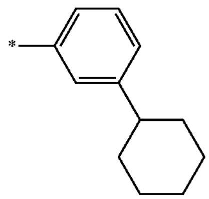
10-98
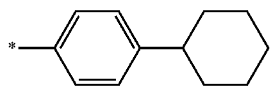
10-99
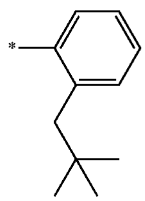
10-100
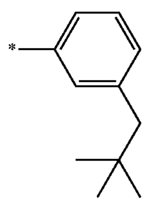
10-101
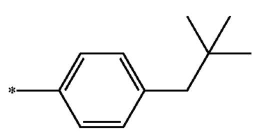
10-102
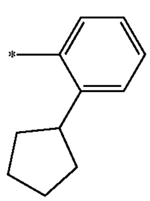
10-103
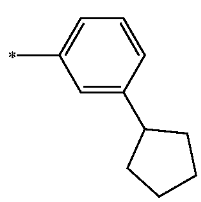
10-104
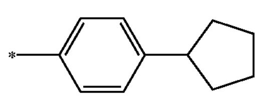
-continued
10-105
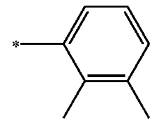
10-106
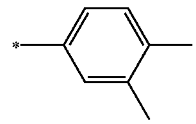
10-107
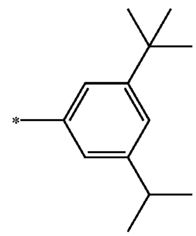
10-108
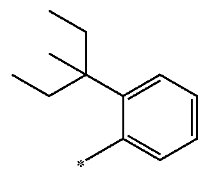
10-109
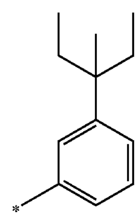
10-110
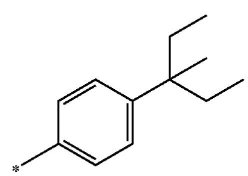
10-111
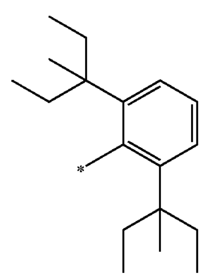
10-112
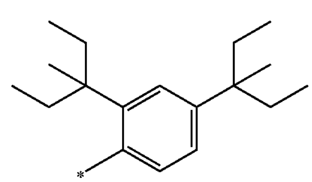

-continued
10-113
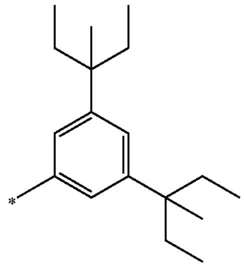
10-114
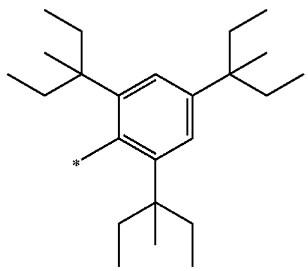
10-115
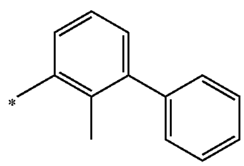
10-116
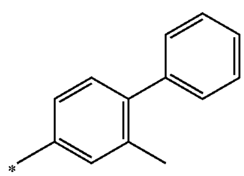
10-117
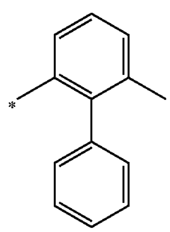
10-118
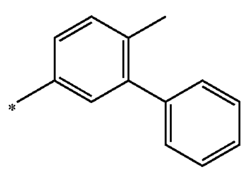
10-119
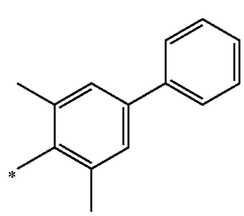
-continued
10-120
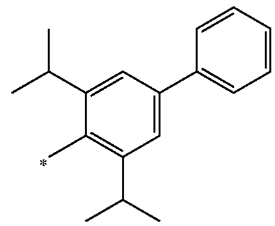
10-121
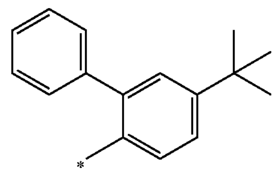
10-122
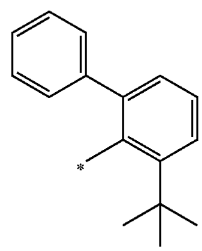
10-123
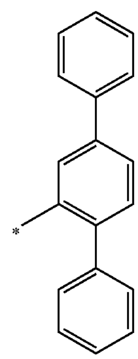
10-124
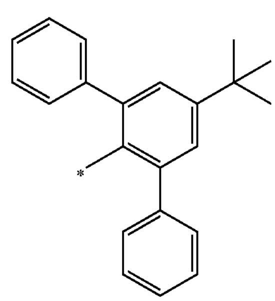
10-125
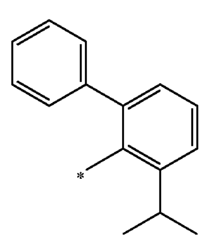

-continued
10-126
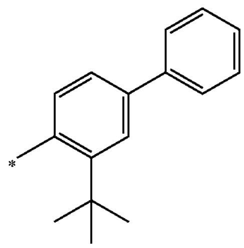
10-127
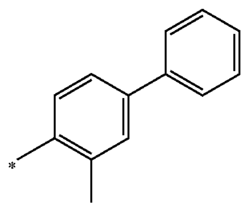
10-128
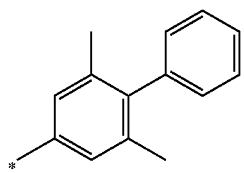
10-129
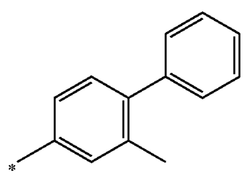
10-201
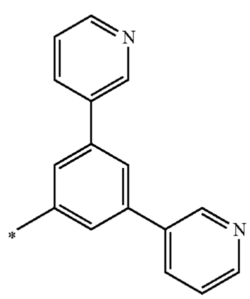
10-202
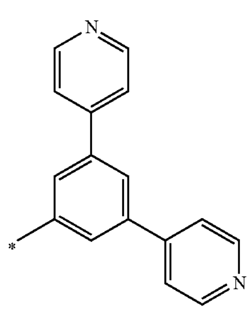
-continued
10-203
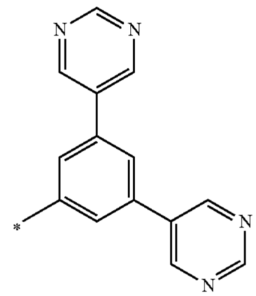
10-204
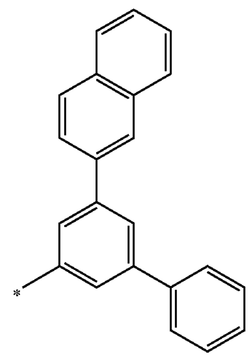
10-205
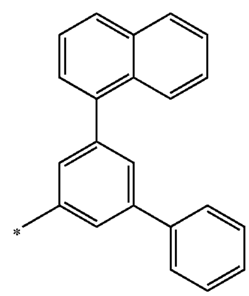
10-206
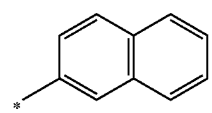
10-207
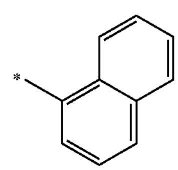
10-208
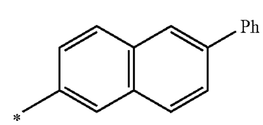
10-209
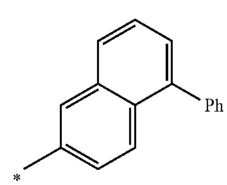

-continued
10-210
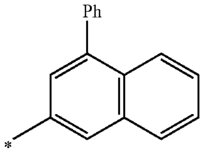
10-211
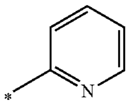
10-212
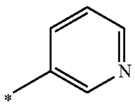
10-213
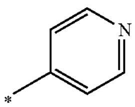
10-214
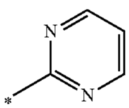
10-215
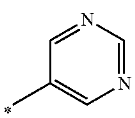
10-216
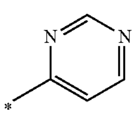
10-217
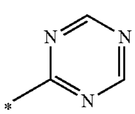
10-218
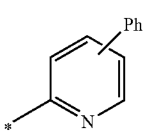
10-219
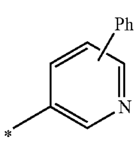
10-220
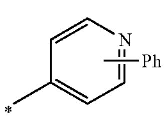
10-221
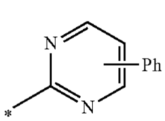
-continued
10-222
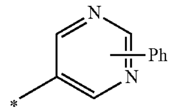
10-223
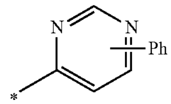
10-224
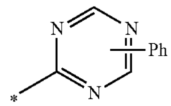
10-225
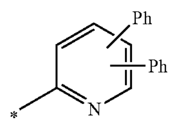
10-226
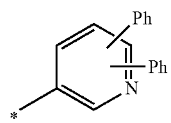
10-227
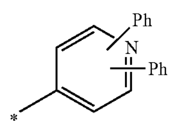
10-228
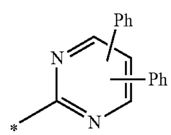
10-229
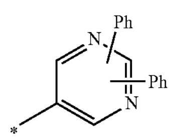
10-230
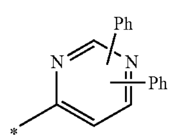
10-231
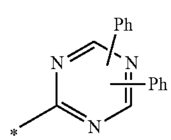
10-232
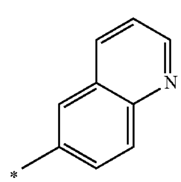

-continued
10-233
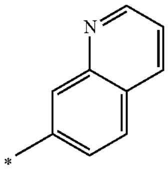
10-234
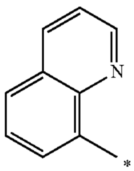
10-235
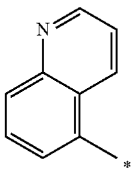
10-236
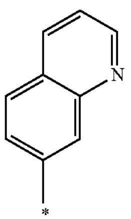
10-237
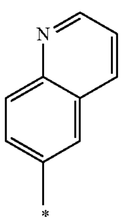
10-238
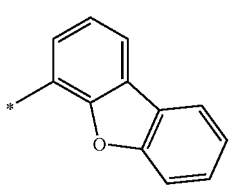
10-239
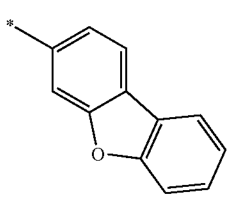
-continued
10-240
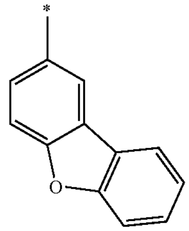
10-241
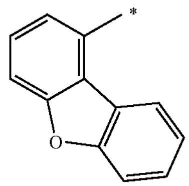
10-242
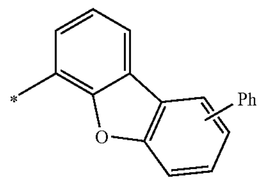
10-243
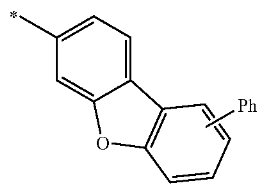
10-244
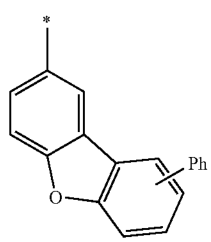
10-245
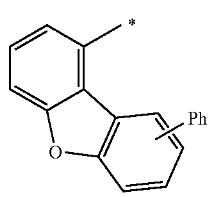
10-246
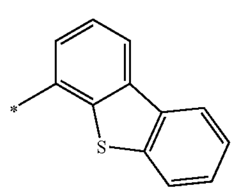

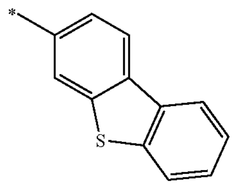
10-247
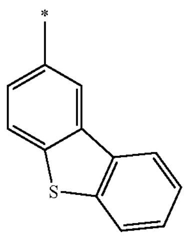
10-248
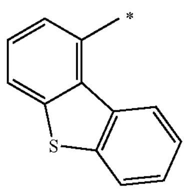
10-249
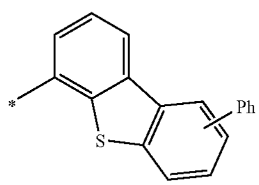
10-250
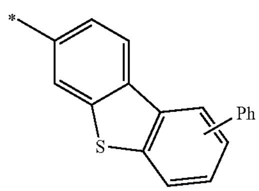
10-251
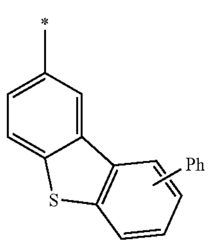
10-252
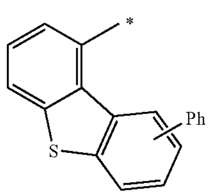
10-253
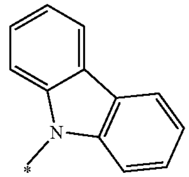
10-254
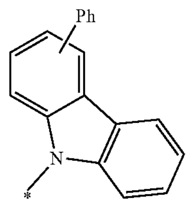
10-255
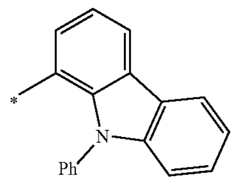
10-256
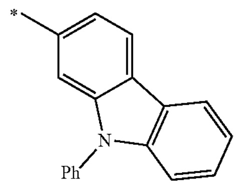
10-257
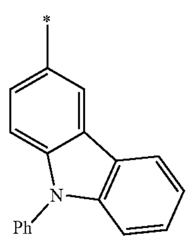
10-258
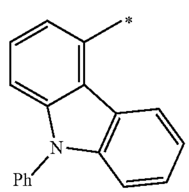
10-259
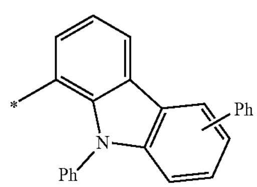
10-260
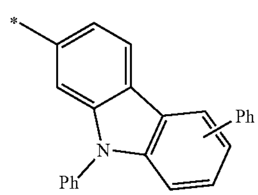
10-261

-continued
10-262
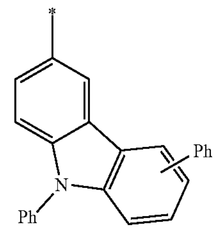
10-263
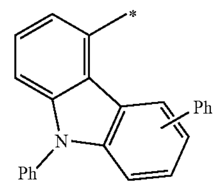
10-264
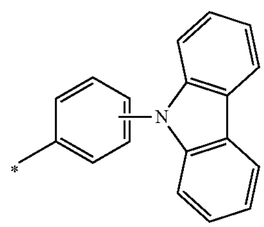
10-265
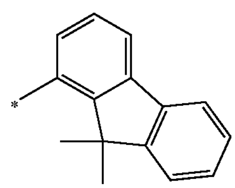
10-266
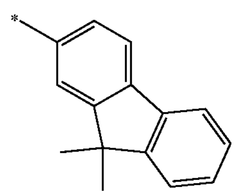
10-267
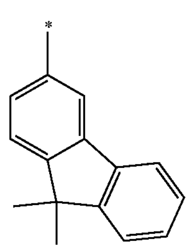
10-268
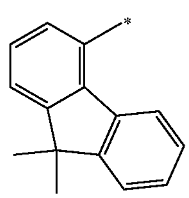
-continued
10-269
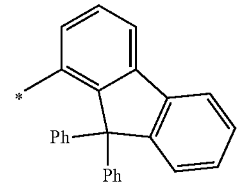
10-270
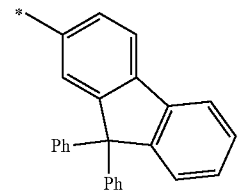
10-271
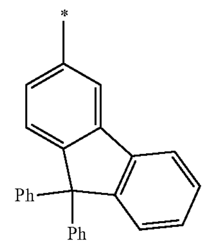
10-272
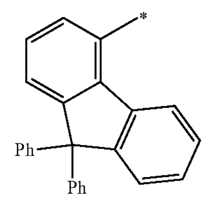
10-273
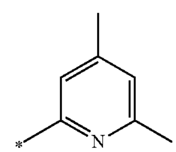
10-274
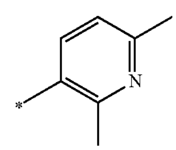
10-275
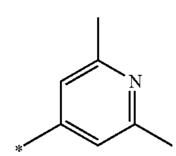
10-276
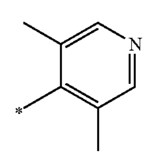

-continued
10-277
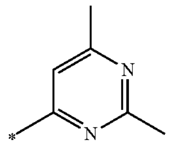
10-278
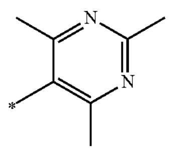
10-279
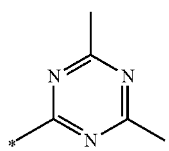
10-280
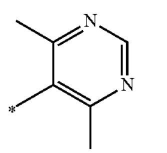
10-281
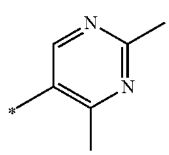
10-282
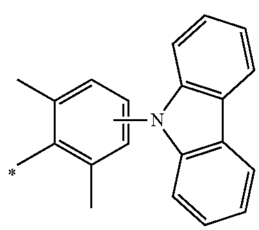
10-283
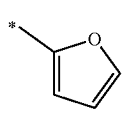
10-284
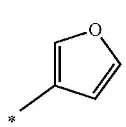
10-285
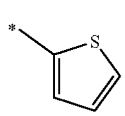
10-286
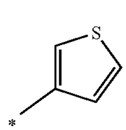
-continued
10-287
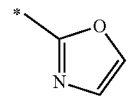
10-288
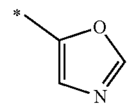
10-289
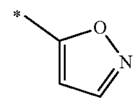
10-290
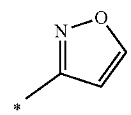
10-291
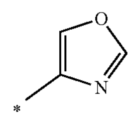
10-292
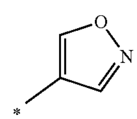
10-293
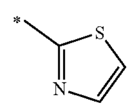
10-294
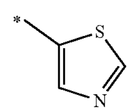
10-295
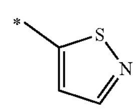
10-296
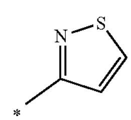
10-297
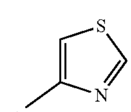
10-298
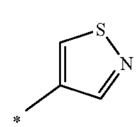
10-299
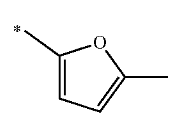

-continued
10-300
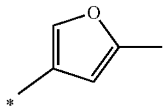
10-301
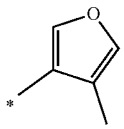
10-302
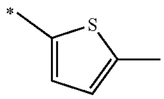
10-303
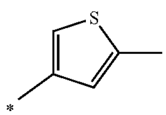
10-304
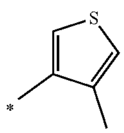
10-305
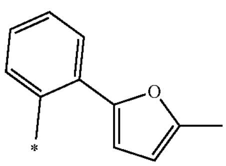
10-306
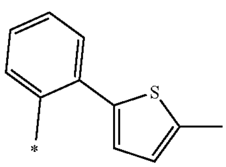
10-307
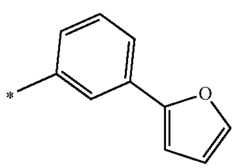
10-308
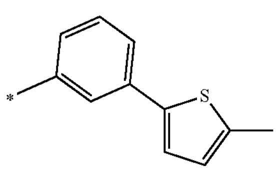
10-309
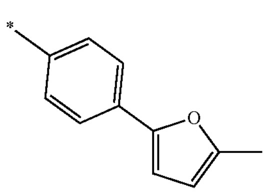
-continued
10-310
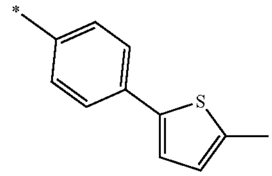
10-311
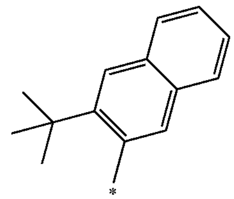
10-312
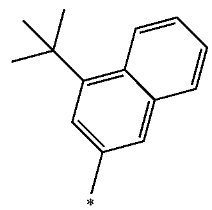
10-313
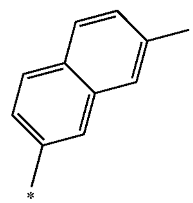
10-314
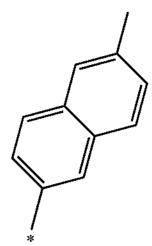
10-315
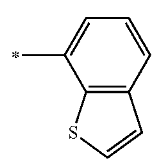
10-316
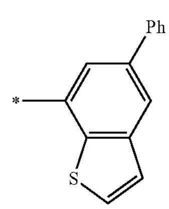

-continued
10-317
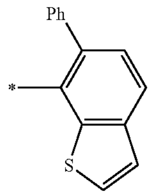
10-318
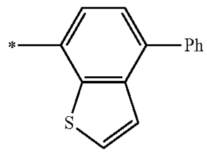
10-319
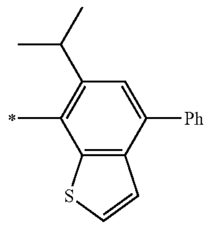
10-320
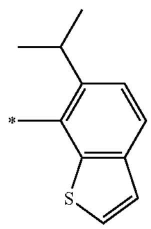
10-321
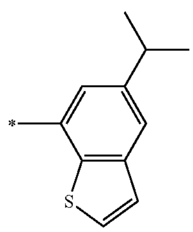
10-322
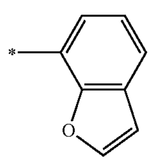
10-323
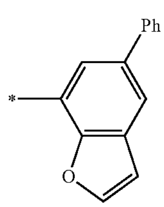
10-324
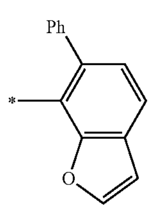
-continued
10-325
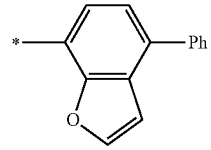
10-326
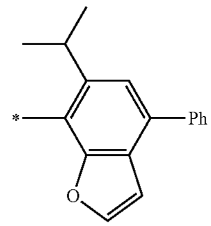
10-327
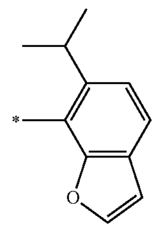
10-328
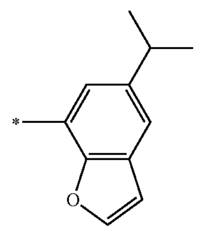
10-329
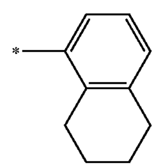
10-330
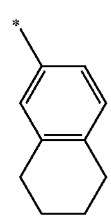
10-331
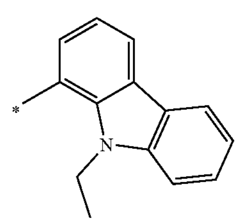

-continued
10-332
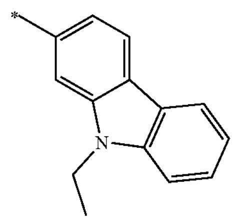
10-333
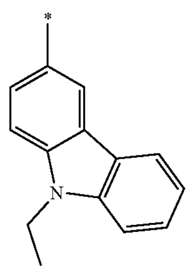
10-334
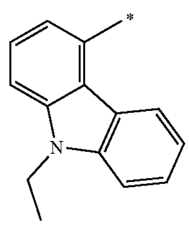
10-335
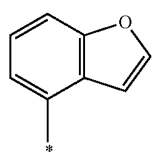
10-336
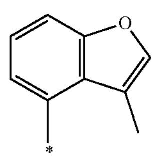
10-337
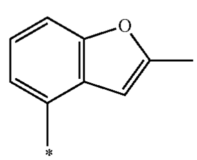
10-338
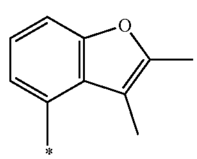
10-339
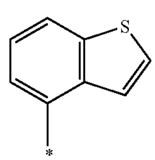
-continued
10-340
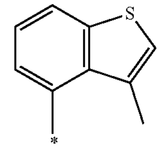
10-341
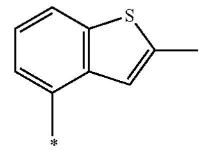
10-342
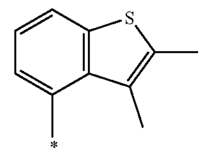
10-343
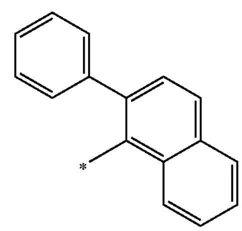
10-344
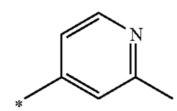
10-345
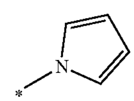
10-346
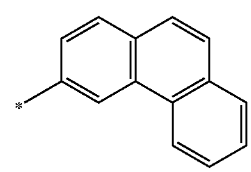
10-347
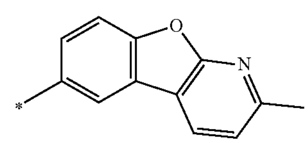
10-348
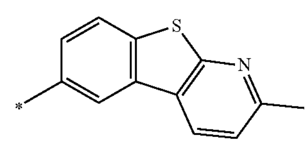
10-349
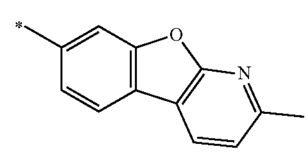

-continued

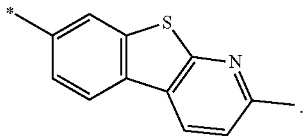

10-350

In Formulae 9-1 to 9-39, 9-201 to 9-227, 10-1 to 10-129, and 10-201 to 10-350, * indicates a binding site to a neighboring atom, “Ph” is a phenyl group, “TMS” is a trimethylsilyl group, and “TMG” is a trimethylgermyl group.

The “group represented by one of Formulae 9-1 to 9-39 in which at least one hydrogen is substituted with deuterium” and the “group represented by one of Formulae 9-201 to 9-227 in which at least one hydrogen is substituted with deuterium” may each be, for example, a group represented by one of Formulae 9-501 to 9-514 and 9-601 to 9-636:

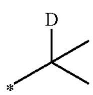

9-501

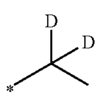

9-502

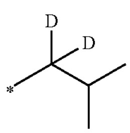

9-503

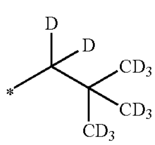

9-504

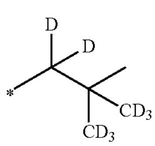

9-505

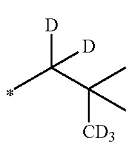

9-506

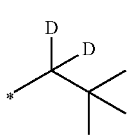

9-507

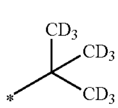

9-508

-continued

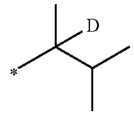

9-509

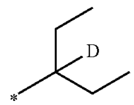

9-510

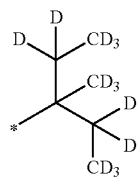

9-511

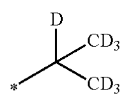

9-512

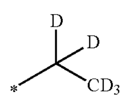

9-513

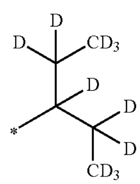

9-514

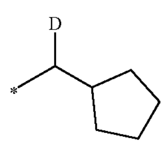

9-601

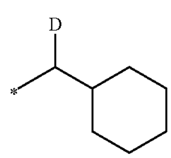

9-602

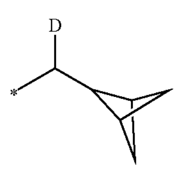

9-603

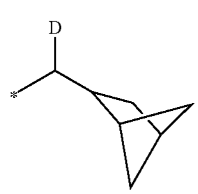

9-604

-continued
9-605
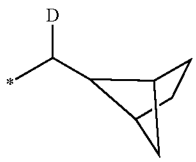
9-606
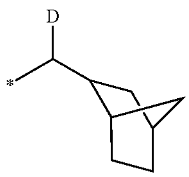
9-607
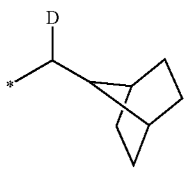
9-608
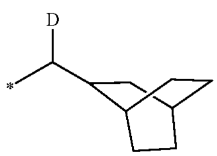
9-609
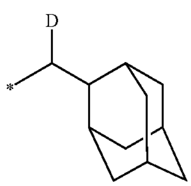
9-610
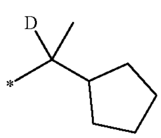
9-611
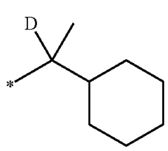
9-612
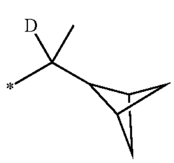
9-613
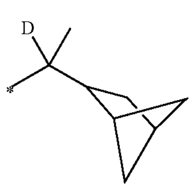
-continued
9-614
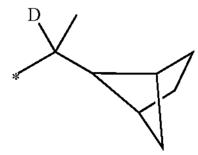
9-615
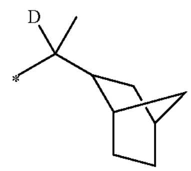
9-616
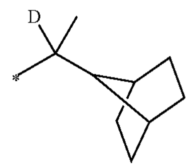
9-617
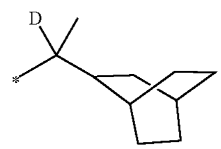
9-618
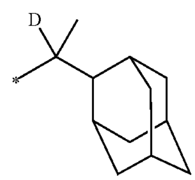
9-619
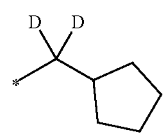
9-620
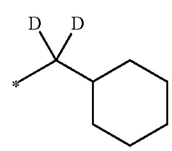
9-621
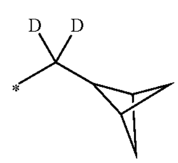
9-622
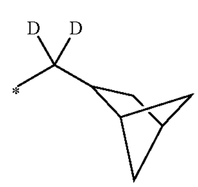
9-623
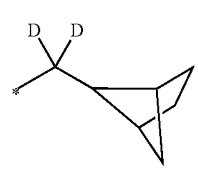

-continued
9-624
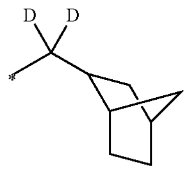
9-625
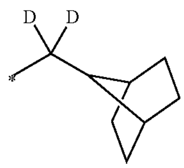
9-626
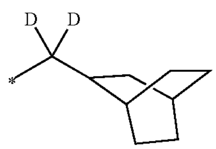
9-627
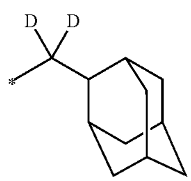
9-628
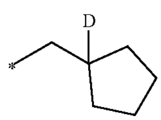
9-629
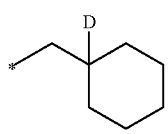
9-630
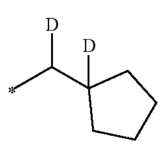
9-631
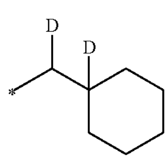
9-632
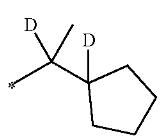
9-633
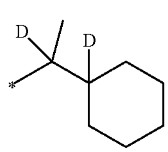
-continued
9-634
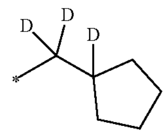
9-635
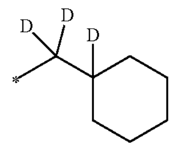
9-636
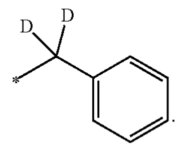
The "group represented by one of Formulae 9-1 to 9-39 in which at least one hydrogen is substituted with —F" and the "group represented by one of Formulae 9-201 to 9-227 in which at least one hydrogen is substituted with —F" may each be, for example, a group represented by one of Formulae 9-701 to 9-710:
9-701
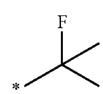
9-702
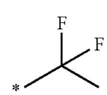
9-703
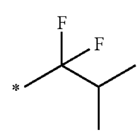
9-704
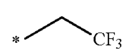
9-705
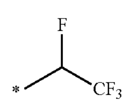
9-706
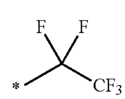
9-707
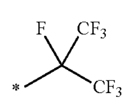
9-708
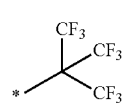

-continued
9-709
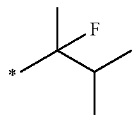
9-710
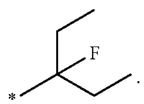
The "group represented by one of Formulae 10-1 to 10-129 in which at least one hydrogen is substituted with deuterium" and "the group represented by one of Formulae 10-201 to 10-350 in which at least one hydrogen is substituted with deuterium" may be, for example, a group represented by one of Formulae 10-501 to 10-553:
10-501
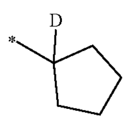
10-502
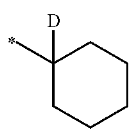
10-503
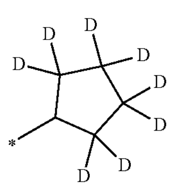
10-504
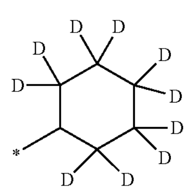
10-505
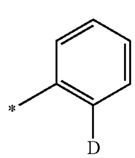
10-506
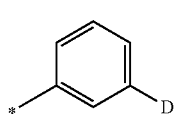
10-507
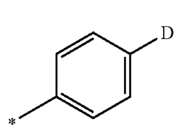
-continued
10-508
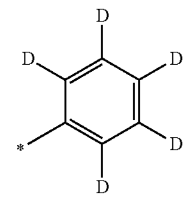
10-509
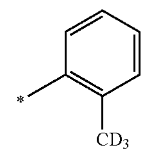
10-510
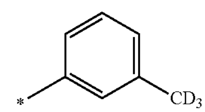
10-511
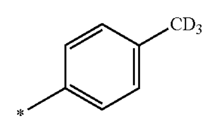
10-512
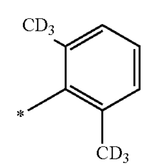
10-513
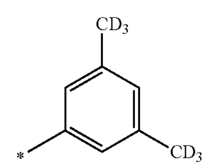
10-514
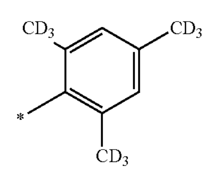
10-515
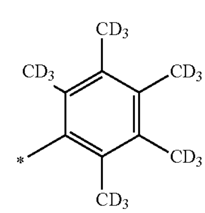
10-516
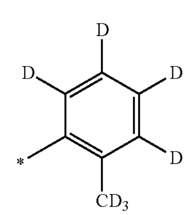

-continued
10-517
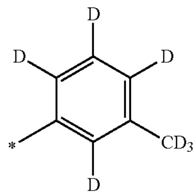
10-518
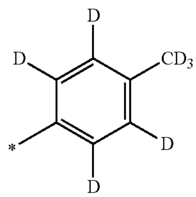
10-519
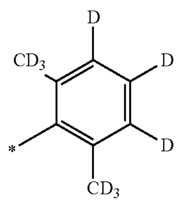
10-520
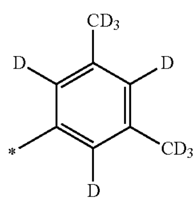
10-521
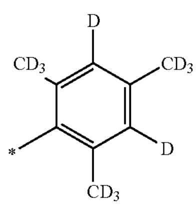
10-522
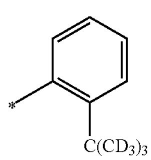
10-523
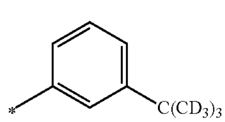
10-524
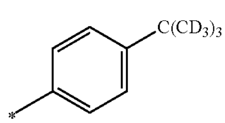
10-525
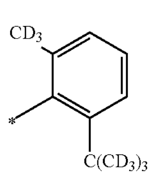
-continued
10-526
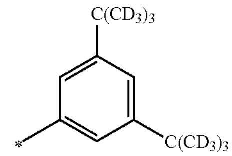
10-527
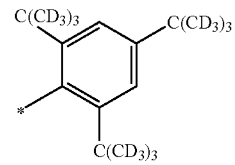
10-528
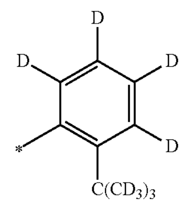
10-529
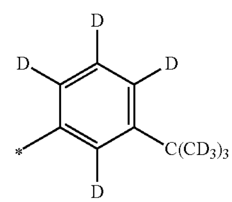
10-530
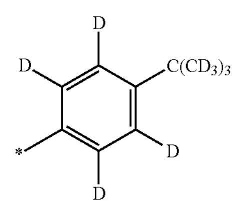
10-531
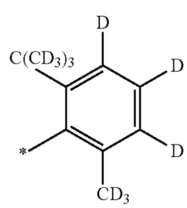
10-532
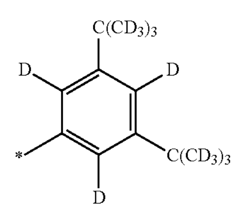
10-533
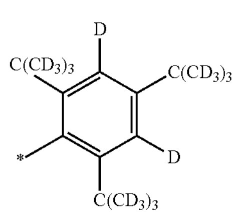

-continued
10-534
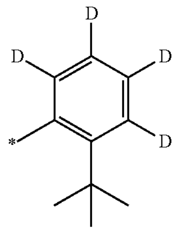
10-535
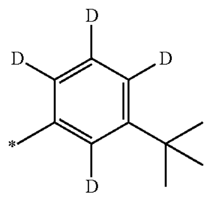
10-536
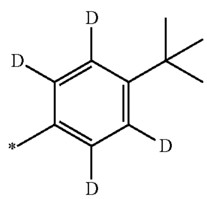
10-537
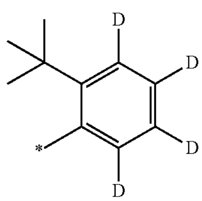
10-538
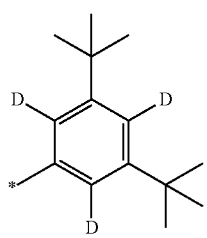
10-540
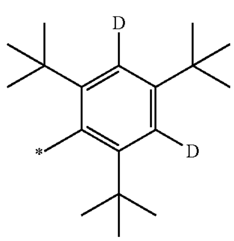
10-541
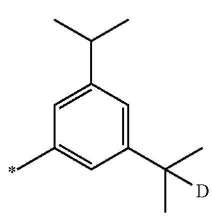
-continued
10-542
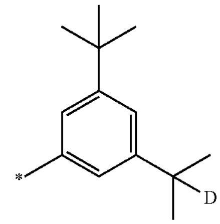
10-543
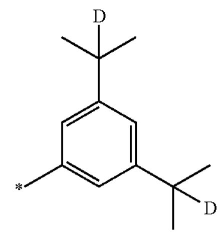
10-544
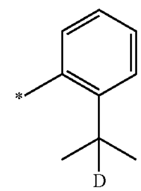
10-545
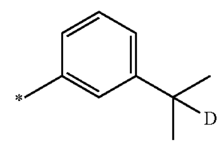
10-546
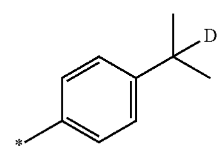
10-547
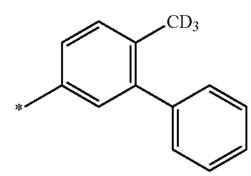
10-548
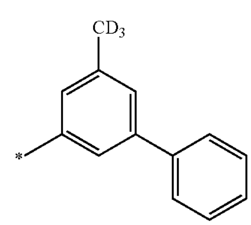
10-549
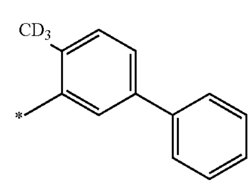

-continued
10-550
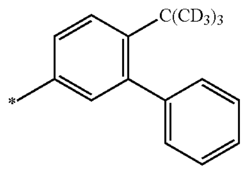
10-551
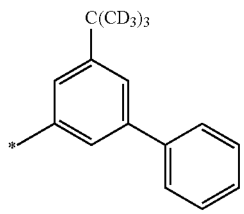
10-552
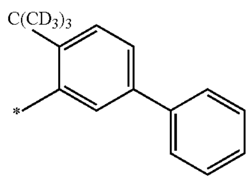
10-553
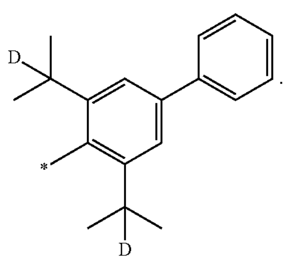
The "group represented by one of Formulae 10-1 to 10-129 in which at least one hydrogen is substituted with —F" and "the group represented by one of Formulae 10-201 to 10-350 in which at least one hydrogen is substituted with —F" may be, for example, a group represented by one of Formulae 10-601 to 10-617:
10-601
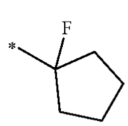
10-602
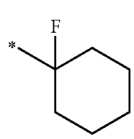
10-603
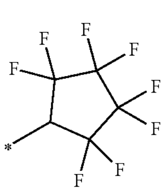
-continued
10-604
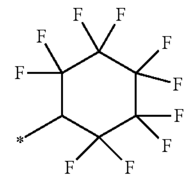
10-605
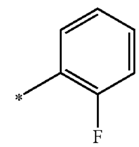
10-606
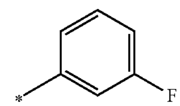
10-607
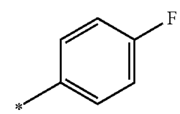
10-608
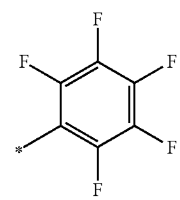
10-609
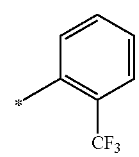
10-610
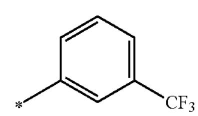
10-611
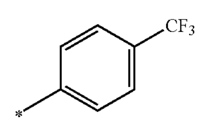
10-612
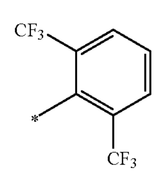
10-613
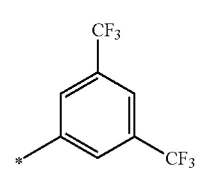

-continued 10-614

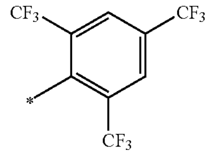

10-615

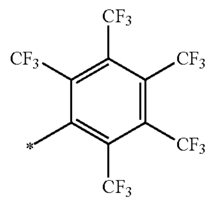

10-616

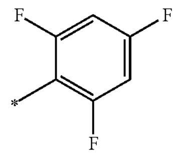

10-617

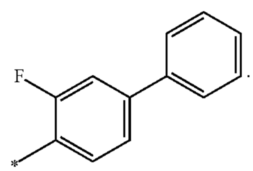

e1 to e4 and d1 to d4 in Formulae 2-1 and 2-2 each indicate the numbers of $Z_1$ to $Z_4$, a group represented by *—[$W_1$—$(Z_1)_{e1}$], a group represented by *—[$W_2$—$(Z_2)_{e2}$], a group represented by *—[$W_3$—$(Z_3)_{e3}$], and a group represented by *—[$W_4$—$(Z_4)_{e4}$], respectively, and may each independently be an integer from 0 to 20. When e1 is 2 or greater, two or more of $Z_1$ may be identical to or different from each other, when e2 is 2 or greater, two or more of $Z_2$ may be identical to or different from each other, when e3 is 2 or greater, two or more of $Z_3$ may be identical to or different from each other, when e4 is 2 or greater, two or more of $Z_4$ may be identical to or different from each other, when d1 is 2 or greater, two or more of groups represented by *—[$W_1$—$(Z_1)_{e1}$] may be identical to or different from each other, when d2 is 2 or greater, two or more of groups represented by *—[$W_2$—$(Z_2)_{e2}$] may be identical to or different from each other, when d3 is 2 or greater, two or more of groups represented by *—[$W_3$—$(Z_3)_{e3}$] may be identical to or different from each other, and when d4 is 2 or greater, two or more of groups represented by *—[$W_4$—$(Z_4)_{e4}$] may be identical to or different from each other. For example, e1 to e4 and d1 to d4 in Formulae 2-1 and 2-2 may each independently be 0, 1, 2, or 3.

Meanwhile, in one or more embodiments, the iridium-containing organometallic compound may not be tris[2-phenylpyridine]iridium.

In one or more embodiments, in Formula 2-1, a case where $Y_1$ is N, ring $A_1$ is a pyridine group, $Y_2$ is C, ring $A_2$ is a benzene group, and each of d1 and d2 is 0 may be excluded.

In Formulae 2-1 and 2-2, at least one of i) two or more of a plurality of $Z_1$, ii) two or more of a plurality of $Z_2$, iii) two or more of a plurality of $Z_3$, iv) two or more of a plurality of $Z_4$, and v) two or more of $Z_1$ to $Z_4$ may independently and optionally be bonded to each other to form a $C_5$-$C_{30}$ carbocyclic group that is unsubstituted or substituted with at least one $R_{10a}$, or a $C_1$-$C_{30}$ heterocyclic group that is unsubstituted or substituted with at least one $R_{10a}$.

$R_{10a}$ may be as described herein in connection with $Z_1$.

The symbols * and *' as used herein each indicate a binding site to a neighboring atom, unless otherwise stated.

In some embodiments, $Y_1$ in Formula 2-1 may be N, and a group represented by

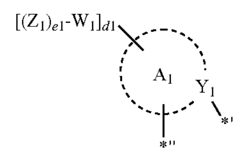

in Formula 2-1 may be a group represented by one of FormulaeA1-1 to A1-3:

A1-1

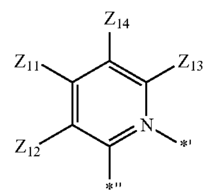

A1-2

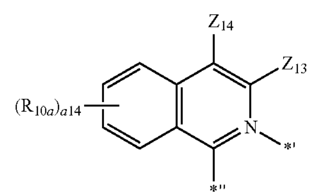

A1-3

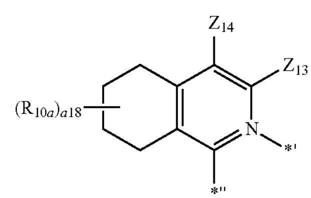

wherein, in Formulae A1-1 to A1-3, $Z_{11}$ to $Z_{14}$ may each be as described in connection with $Z_1$, $R_{10a}$ may be understood by referring to the description of $R_{10a}$ provided herein, a14 may be an integer from 0 to 4, a18 may be an integer from 0 to 8,

*' indicates a binding site to $M_2$ in Formula 2, and

*" indicates a binding site to ring $A_2$.

For example, at least one of $Z_{11}$, $Z_{12}$, and $Z_{14}$ (for example, $Z_{14}$) in Formulae A1-1 to A1-3 may be:

a $C_1$-$C_{20}$ alkyl group that is unsubstituted or substituted with at least one of deuterium, —F, a phenyl group, or a combination thereof;

—Si($Q_3$)($Q_4$)($Q_5$); or

—Ge($Q_3$)($Q_4$)($Q_5$).

In one or more embodiments, $Y_3$ in Formula 2-2 may be N, and a group represented by
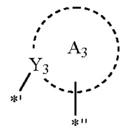
in Formula 2-2 may be a group represented by one of Formulae NR1 to NR48:
NR1
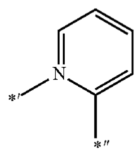
NR2
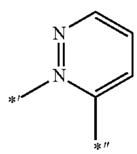
NR3
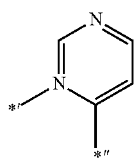
NR4
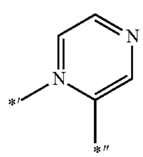
NR5
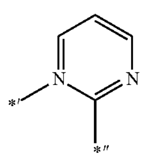
NR6
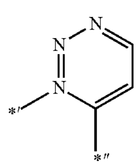
NR7
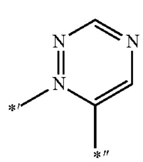
NR8
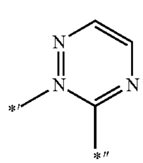
-continued
NR9
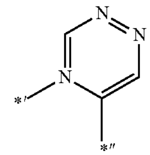
NR10
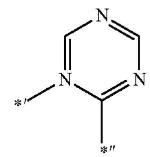
NR11
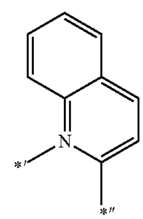
NR12
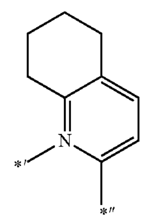
NR13
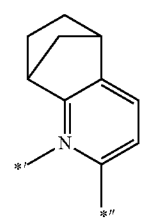
NR14
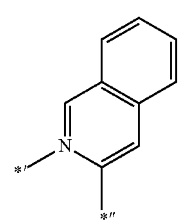
NR15
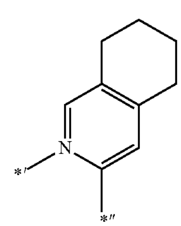

-continued
NR16
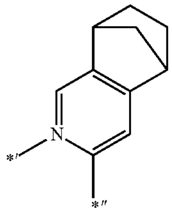
NR17
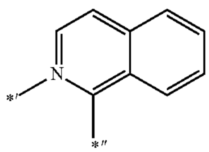
NR18
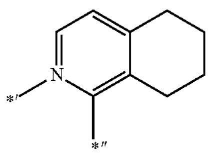
NR19
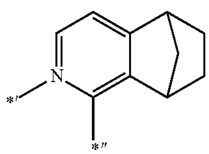
NR20
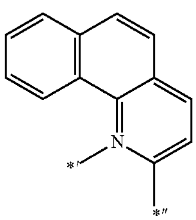
NR21
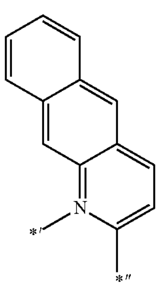
NR22
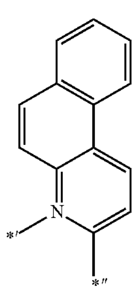
-continued
NR23
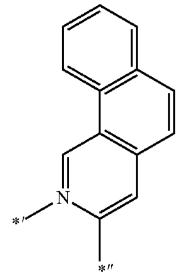
NR24
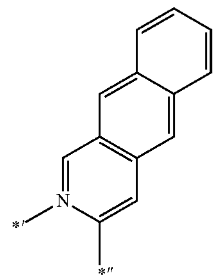
NR25
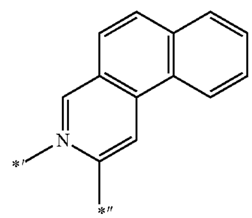
NR26
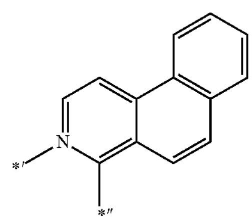
NR27
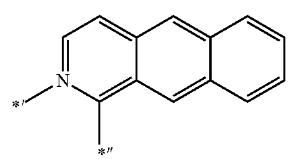
NR28
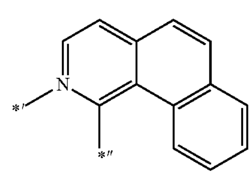
NR29
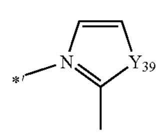

-continued
NR30
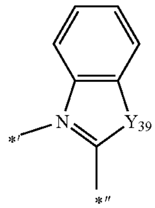
NR31
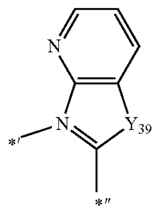
NR32
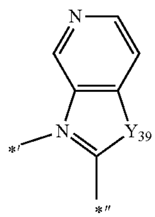
NR33
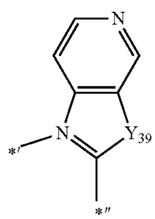
NR34
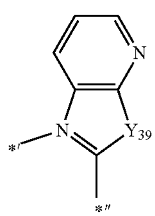
NR35
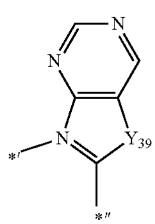
NR36
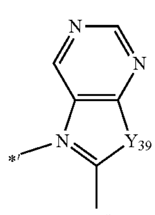
-continued
NR37
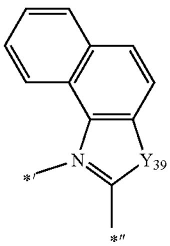
NR38
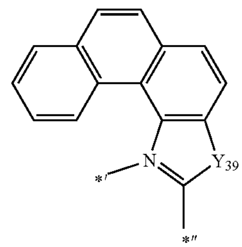
NR39
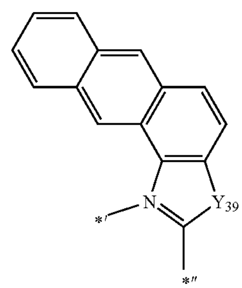
NR40
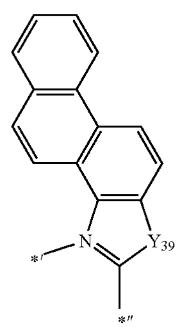
NR41
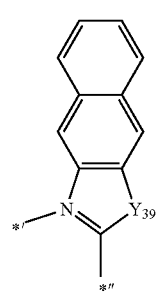

-continued

NR42

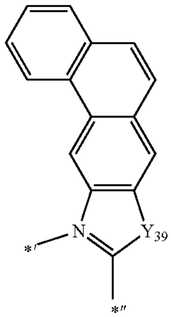

NR43

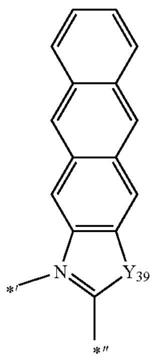

NR44

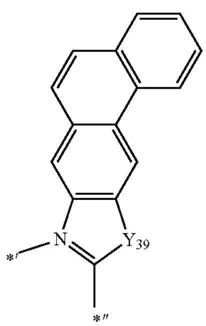

NR45

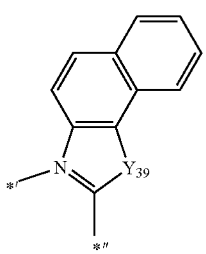

NR46

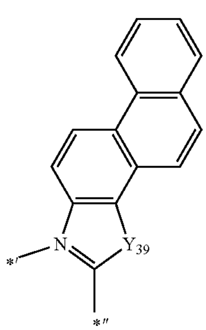

-continued

NR47

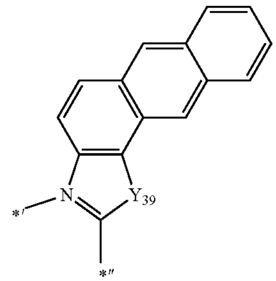

NR48

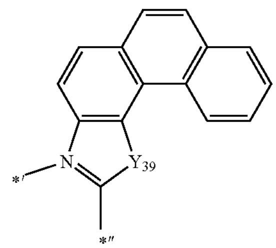

wherein, in Formulae NR1 to NR48, $Y_{39}$ may be O, S, Se, N—[$W_3$—$(Z_3)_{e3}$], $C(Z_{39a})(Z_{39b})$, or $Si(Z_{39a})(Z_{39b})$, $W_3$, $Z_3$, and e3 may each be as described herein, and $Z_{39a}$ and $Z_{39b}$ may each be as described in connection with $Z_3$,

*' indicates a binding site to $M_2$ in Formula 2, and

*" indicates a binding site to ring $A_4$.

In one or more embodiments, in Formulae 2-1 and 2-2, each of $Y_2$ and $Y_4$ may be C, and a group represented by

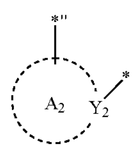

in Formula 2-1 and a group represented by

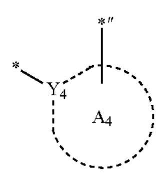

in Formula 2-2 may each independently be a group represented by one of Formulae CR1 to CR29:

CR1

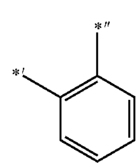

-continued
CR2
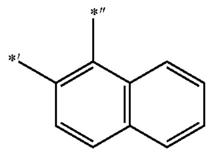
CR3
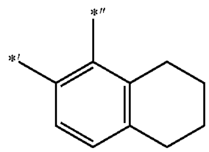
CR4
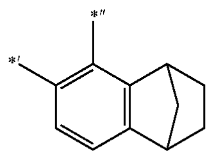
CR5
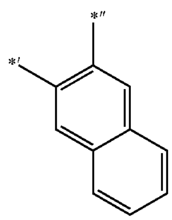
CR6
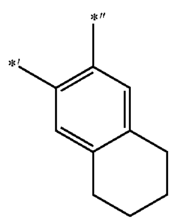
CR7
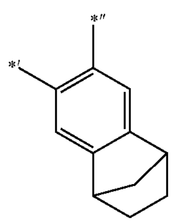
CR8
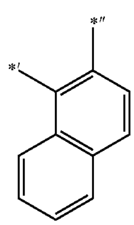
CR9
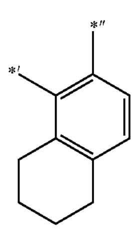
-continued
CR10
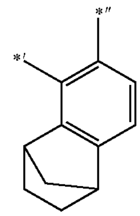
CR11
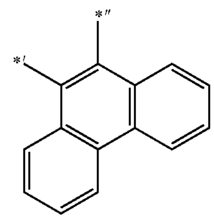
CR12
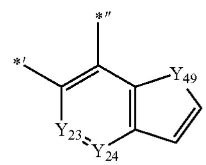
CR13
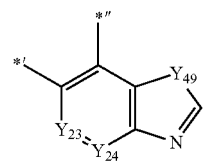
CR14
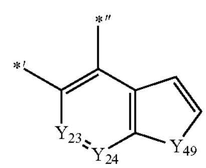
CR15
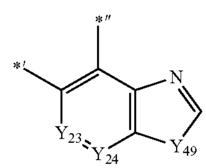
CR16
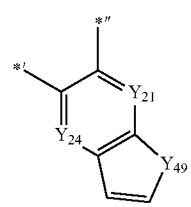
CR17
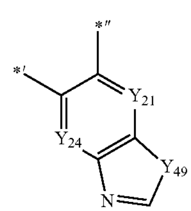

-continued

CR18

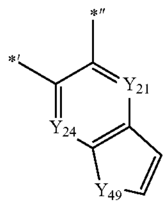

CR19

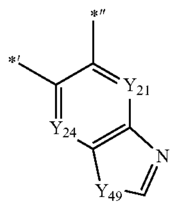

CR20

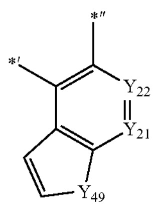

CR21

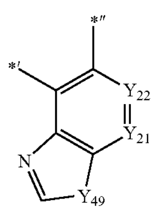

CR22

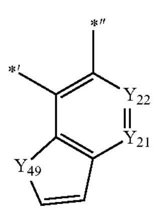

CR23

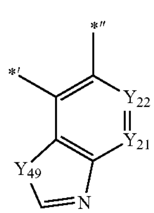

CR24

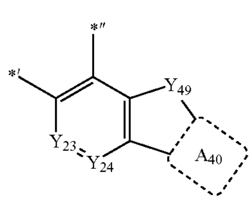

-continued

CR25

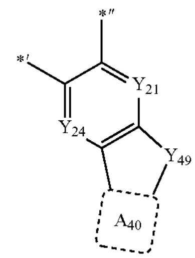

CR26

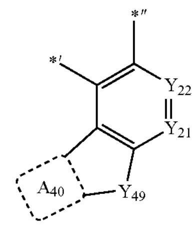

CR27

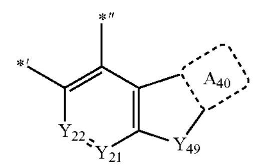

CR28

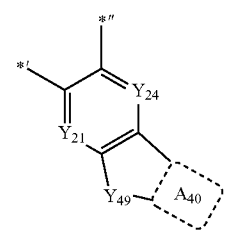

CR29

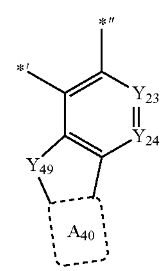

wherein, in Formulae CR1 to CR29, $Y_{49}$ may be O, S, Se, N—[$W_2$—$(Z_2)_{e2}$], N—[$W_4$—$(Z_4)_{e4}$], $C(Z_{29a})(Z_{29b})$, $C(Z_{49a})(Z_{49b})$, $Si(Z_{29a})(Z_{29b})$, or $Si(Z_{49a})(Z_{49b})$, $W_2$, $W_4$, $Z_2$, $Z_4$, e2, and e4 may each be as described herein, $Z_{29a}$ and $Z_{29b}$ may each be as described in connection with $Z_2$, and $Z_{49a}$ and $Z_{49b}$ may each be as described in connection with $Z_4$, $Y_{21}$ to $Y_{24}$ may each independently be N or C, ring $A_{40}$ may be a $C_5$-$C_{30}$ carbocyclic group or a $C_1$-$C_{30}$ heterocyclic group (for example, a benzene group, a naphthalene group, a phenanthrene group, a pyridine group, a pyrimidine group, a pyrazine group, a pyridazine group, a quinoline group, an isoquinoline group, a benzoquinoline group, a benzoisoquinoline group, a quinoxaline group, a benzoquinoxaline group, a quinazoline group, or a benzoquinazoline group),

*indicates a binding site to $M_2$ in Formula 2, and

*" indicates a binding site to ring $A_1$ or ring $A_3$.

In one or more embodiments, a group represented by
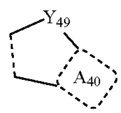
in Formulae CR24 to CR29 may be a group represented by one of Formulae CR(1) to CR(13):
CR(1)
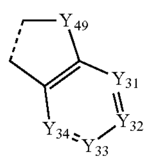
CY(2)
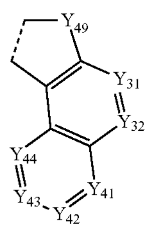
CR(3)
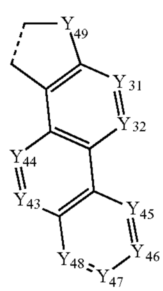
CR(4)
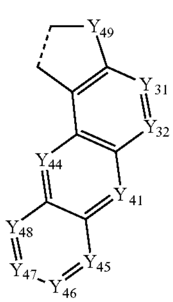
CR(5)
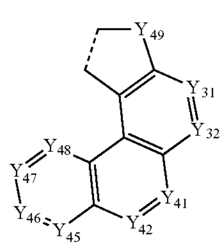
-continued
CR(6)
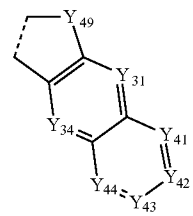
CR(7)
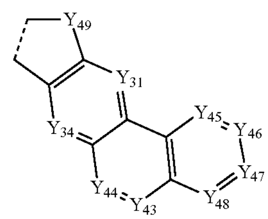
CR(8)
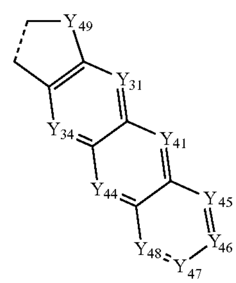
CR(9)
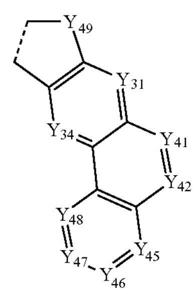
CR(10)
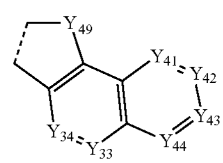
CR(11)
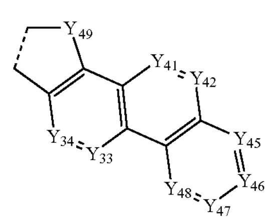
CR(12)
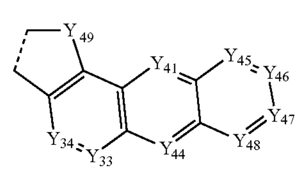

-continued

CR(13)

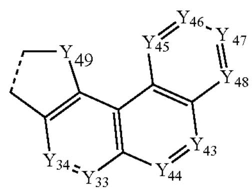

wherein, in Formulae CR(1) to CR(13), $Y_{49}$ may be as described herein, and $Y_{31}$ to $Y_{34}$ and $Y_{41}$ to $Y_{48}$ may each independently be C or N.

In one or more embodiments, the iridium-containing organometallic compound may include at least one deuterium.

In one or more embodiments, the iridium-containing organometallic compound may be an organometallic compound represented by Formula 2 satisfying all of the following i) to v):

i) n11 and n13 each are 0, ii) n12 is 3, and three $L_{12}$ are identical to each other, iii) in Formula 2-2, $Y_3$ is N, and $Y_4$ is C, iv) a group represented by

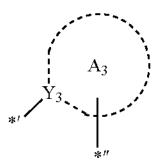

in Formula 2-2 may be a group represented by one of Formulae NR29 to NR48, and v) a group represented by

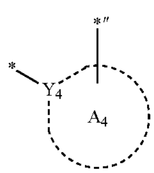

in Formula 2-2 is a group represented by one of Formulae CR24 to CR29, and $Y_{49}$ in Formulae CR24 to CR29 may be O, S, Se, or $Si(Z_{49a})(Z_{49b})$.

For example, the iridium-containing organometallic compound may be at least one of the compounds of Group 1-1 to Group 1-7:

Group 1-1

1

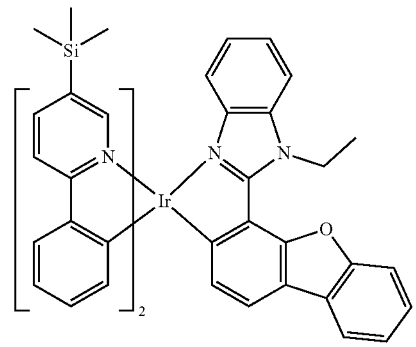

2

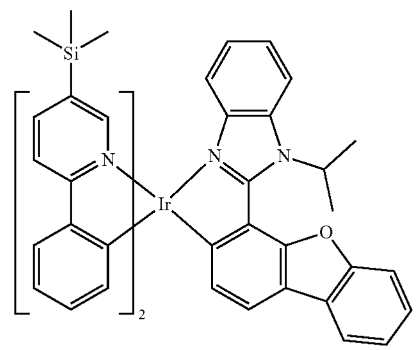

3

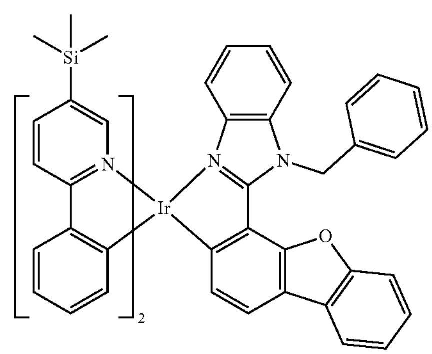

4

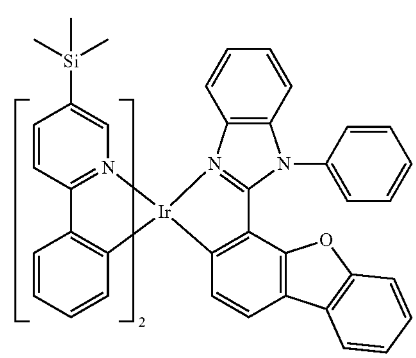

-continued
5
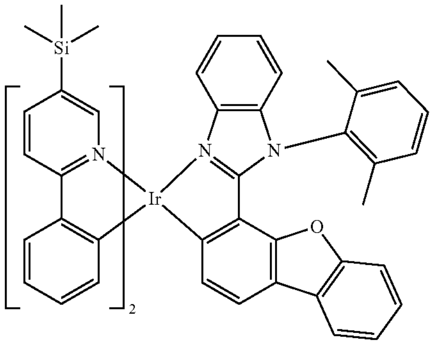
6
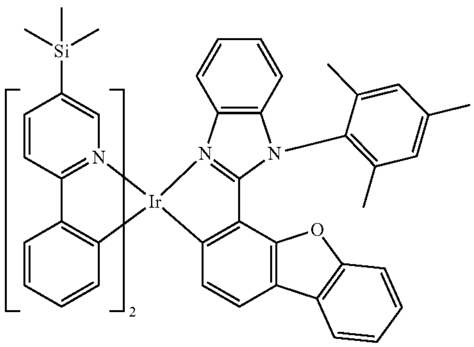
7
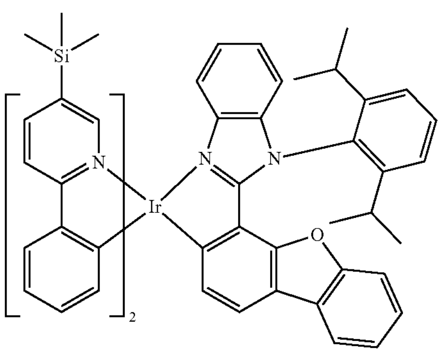
8
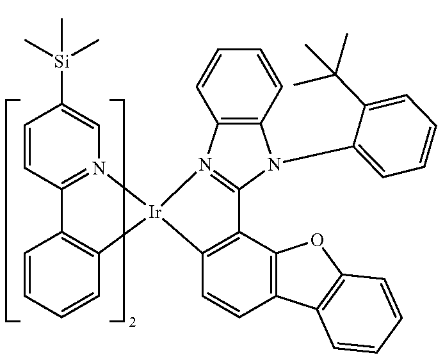
-continued
9
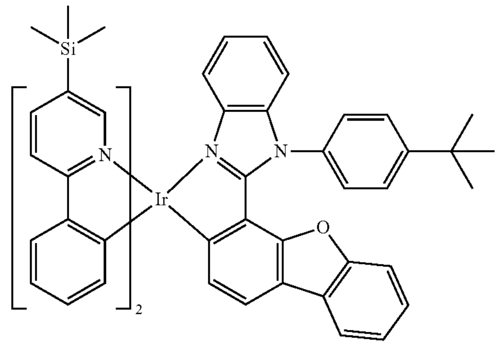
10
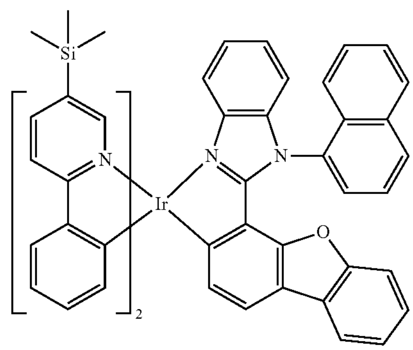
11
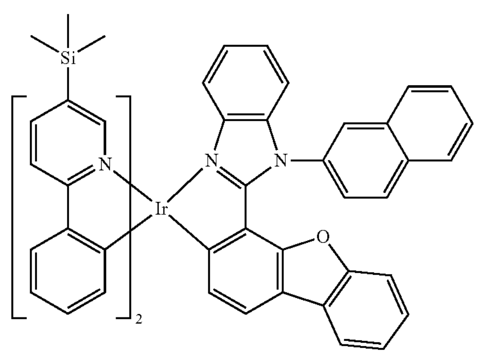
12
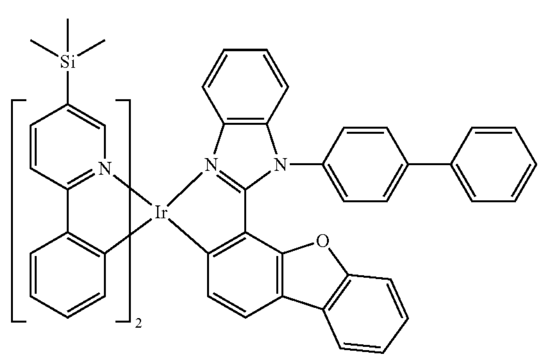

13
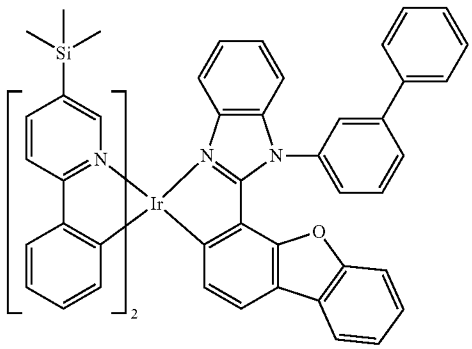
14
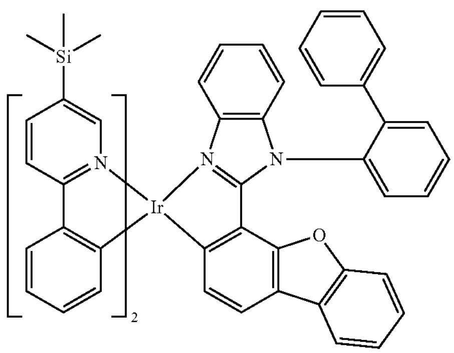
15
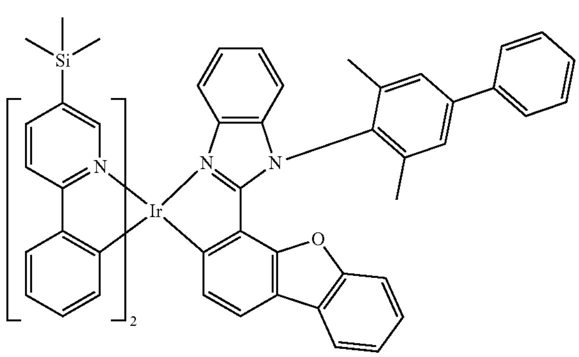
16
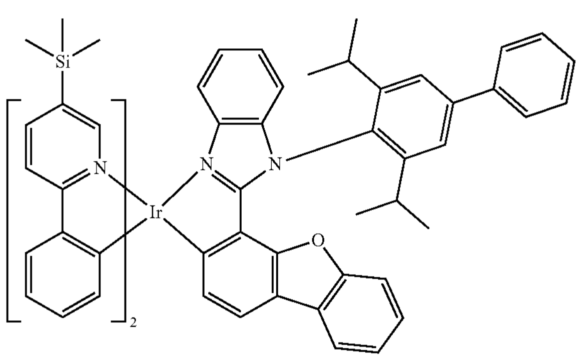
17
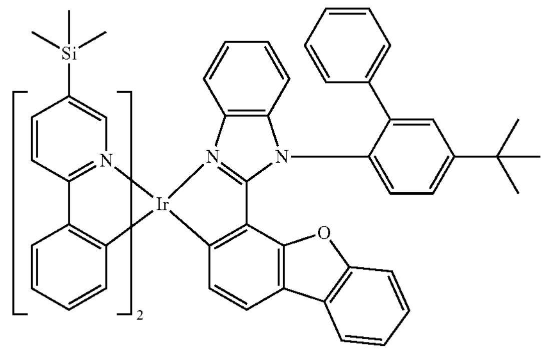
18
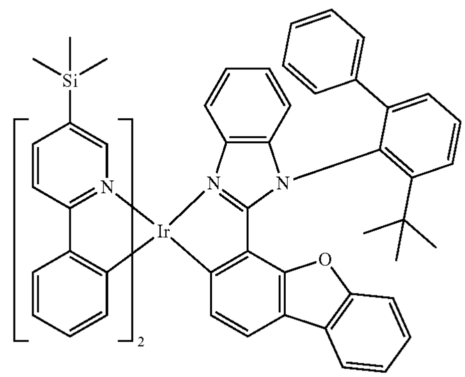
19
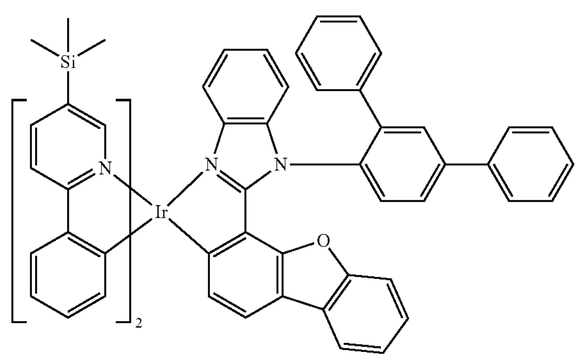
20
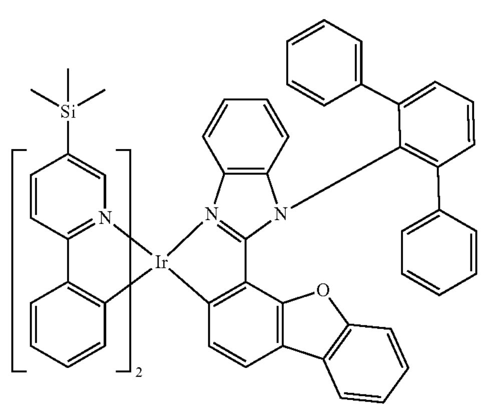

-continued
21
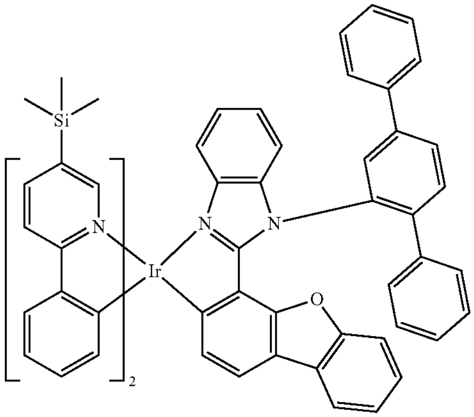
22
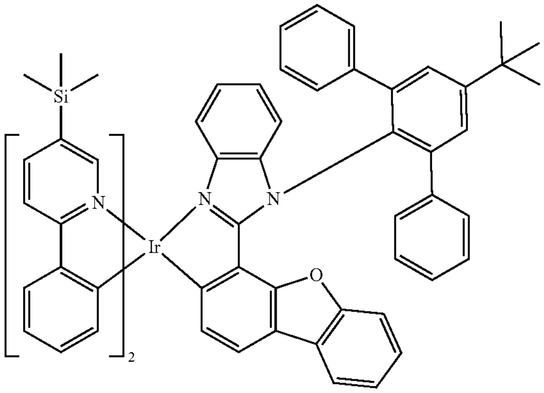
23
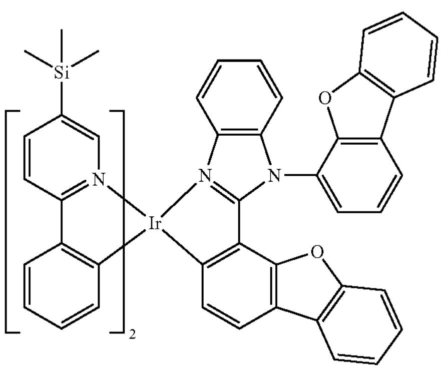
24
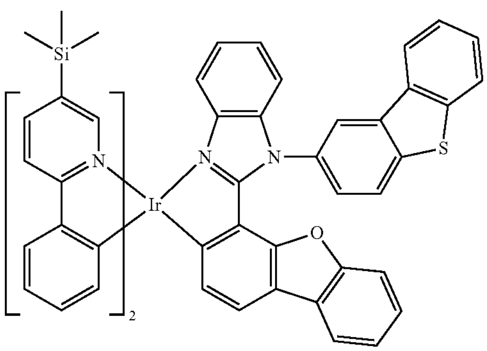
-continued
25
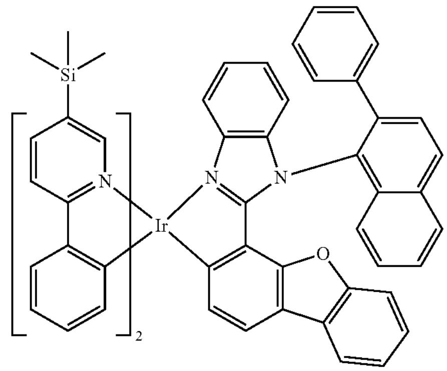
26
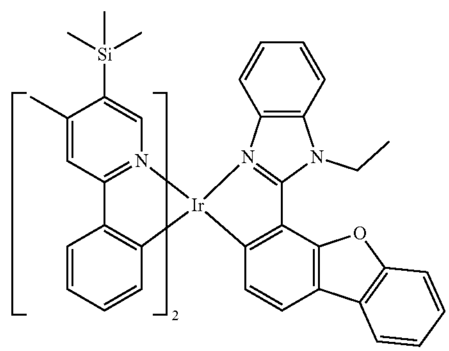
27
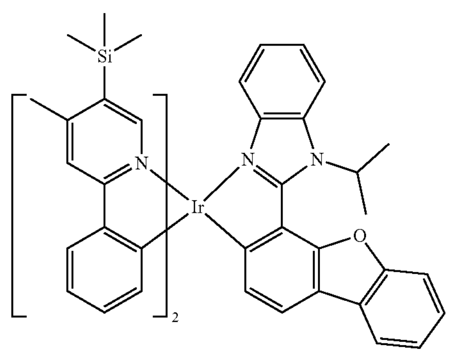
28
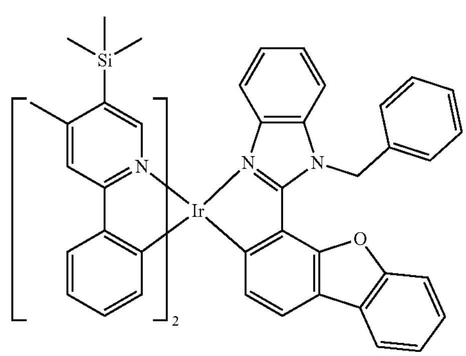

-continued
29
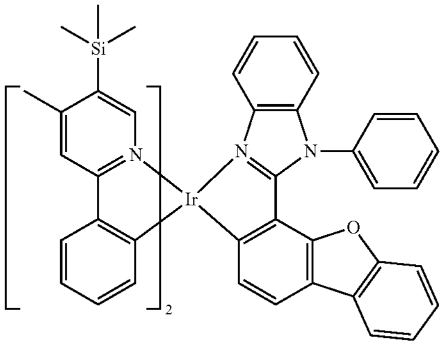
30
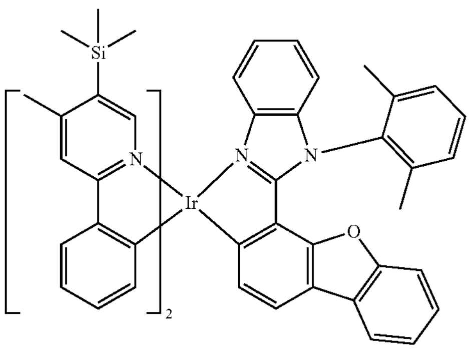
31
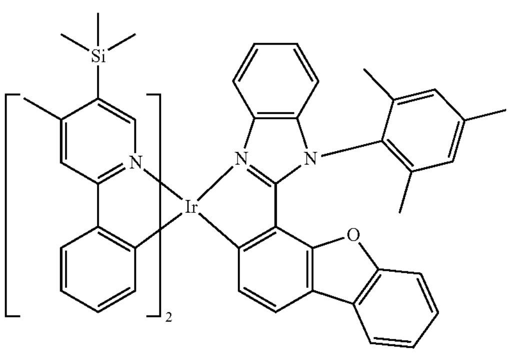
32
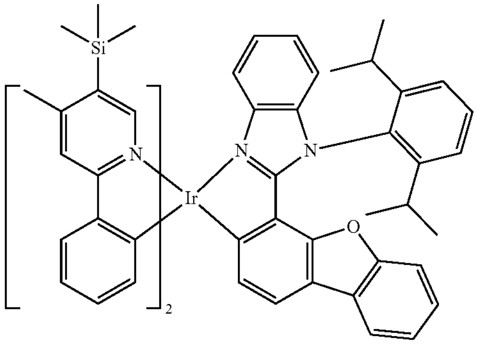
-continued
33
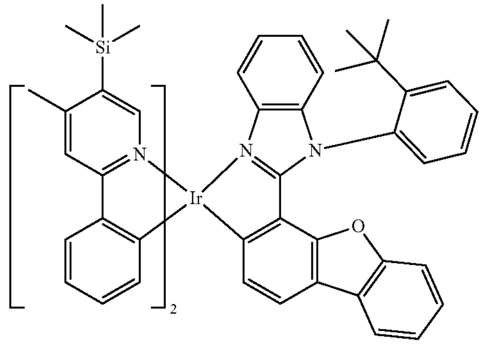
34
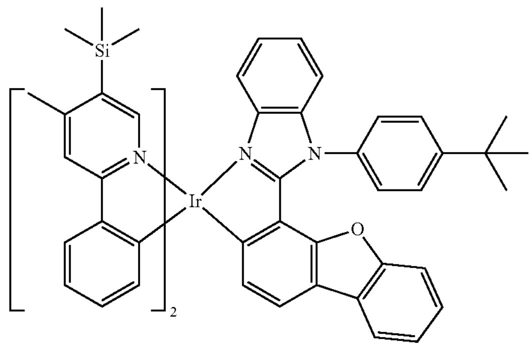
35
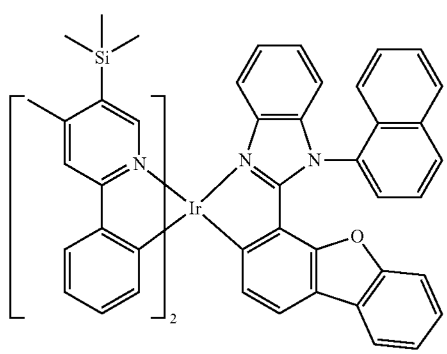
36
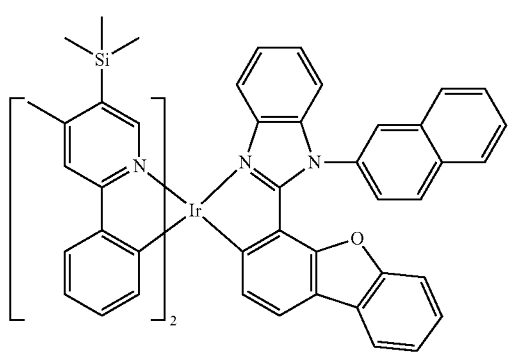

-continued
37
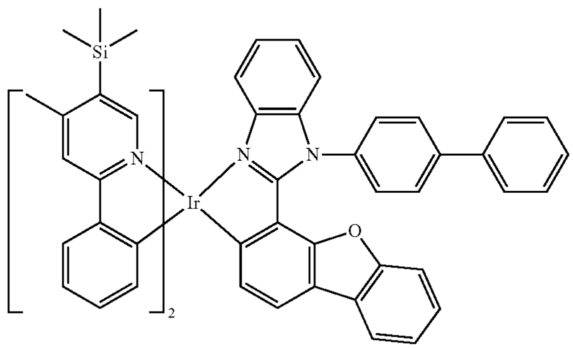
38
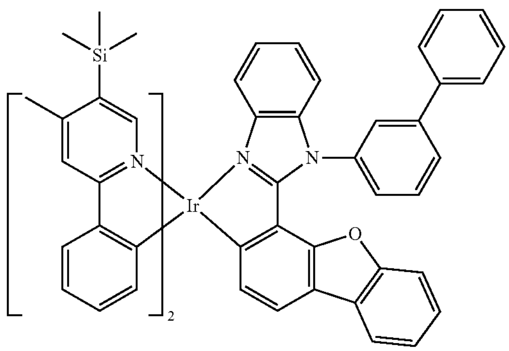
39
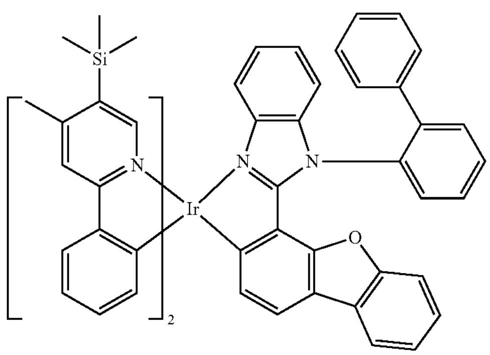
40
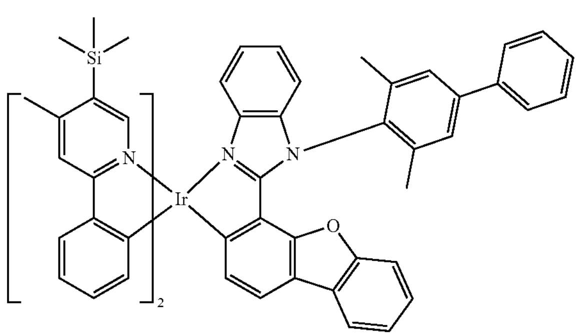
-continued
41
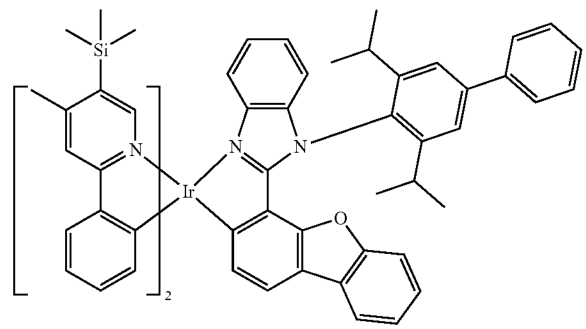
42
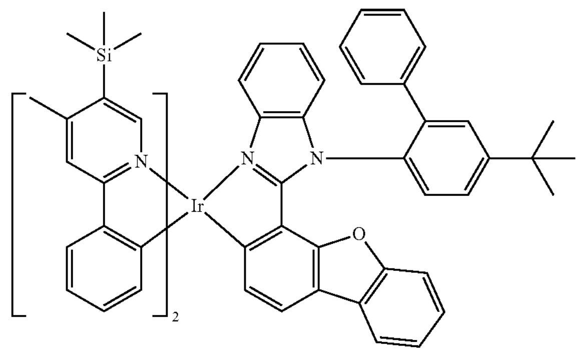
43
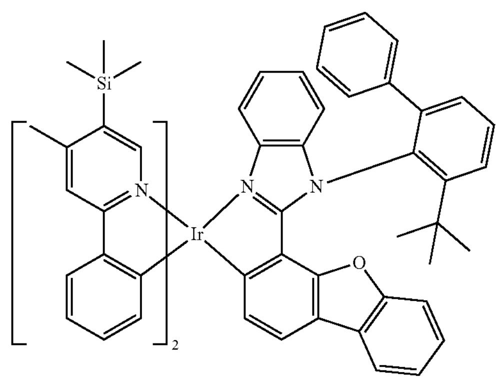
44
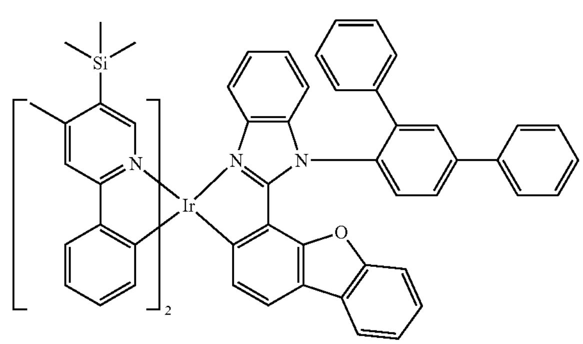

-continued
45
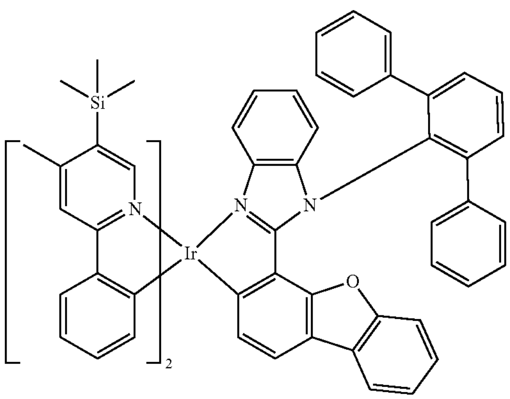
46
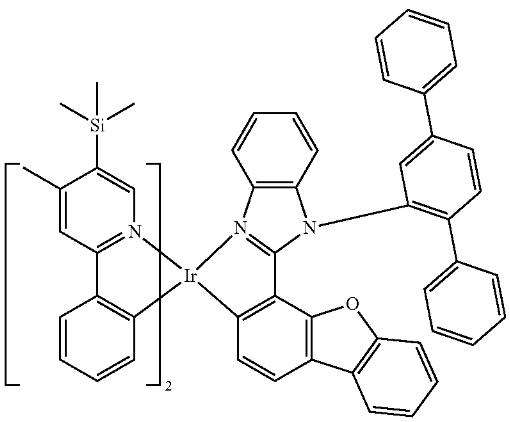
47
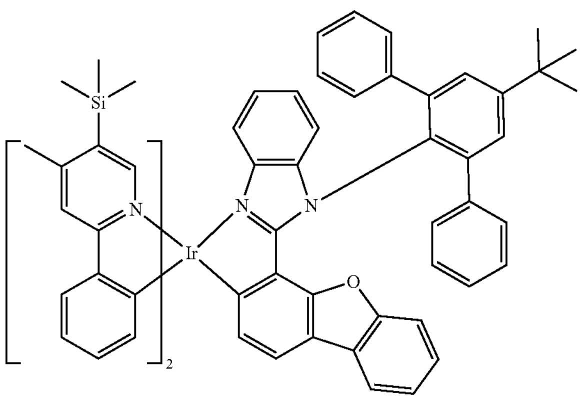
48
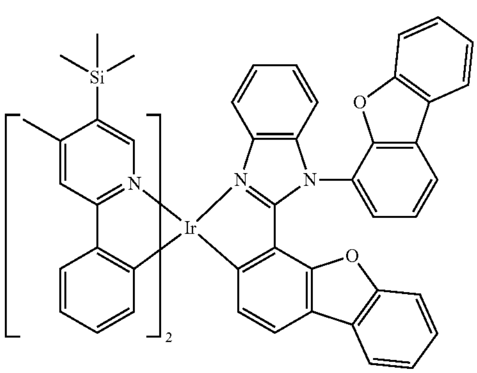
-continued
49
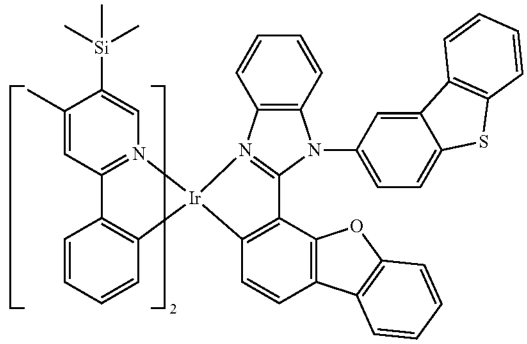
50
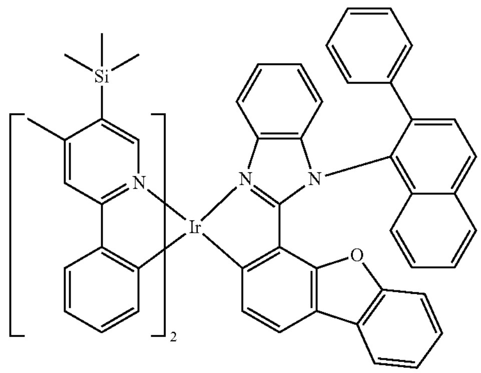
51
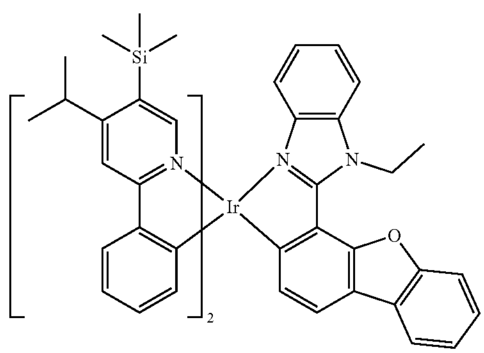
52
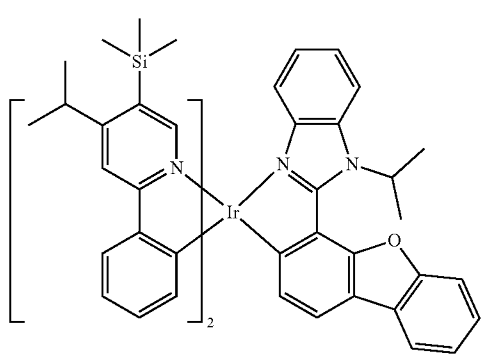

-continued
53
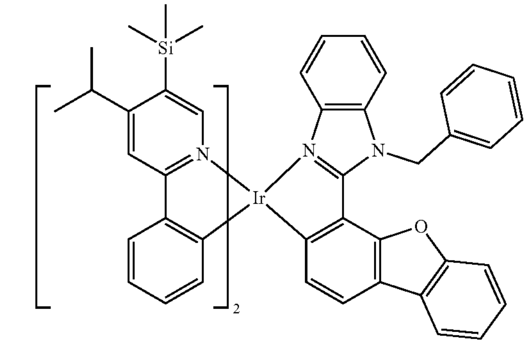
54
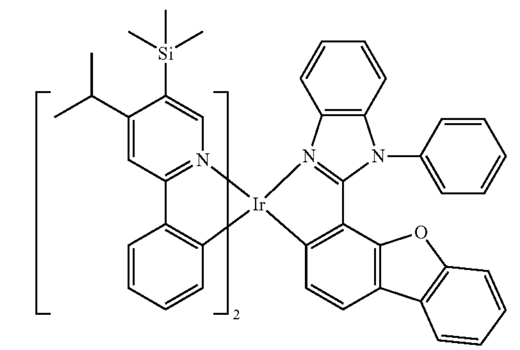
55
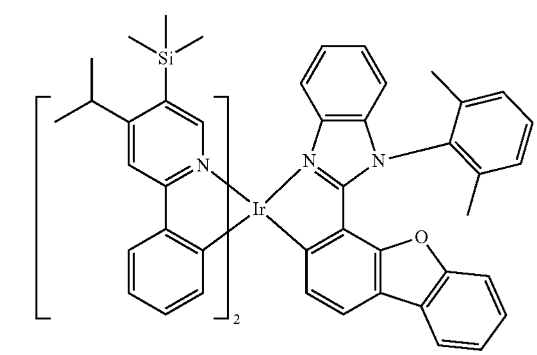
56
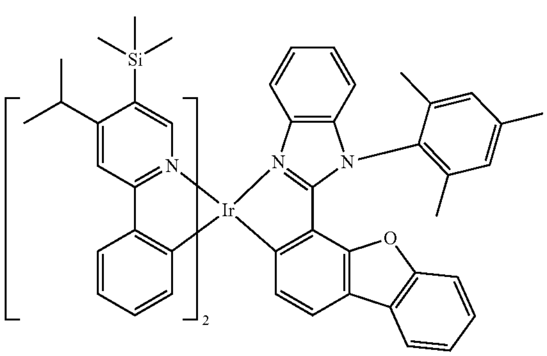
-continued
57
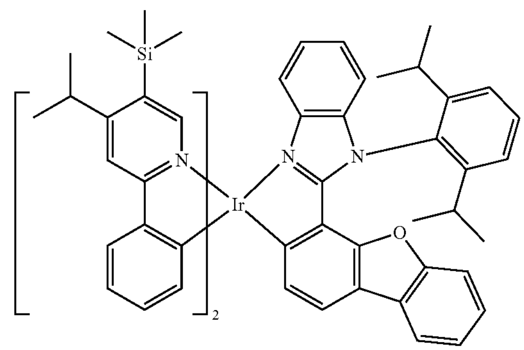
58
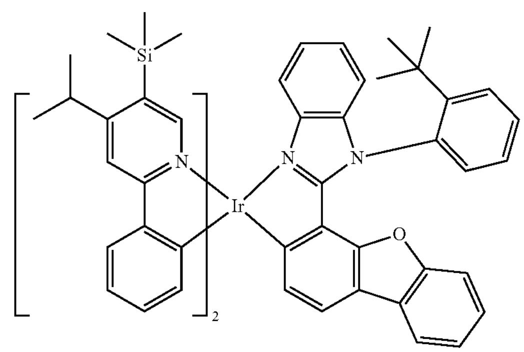
59
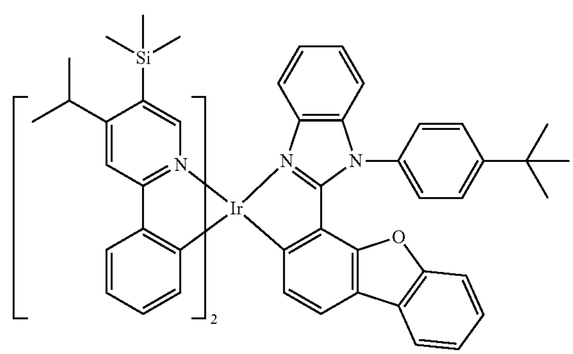
60
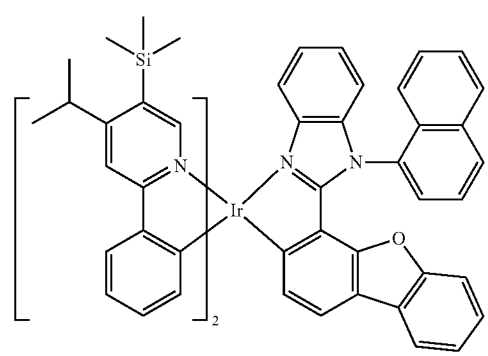

-continued
61
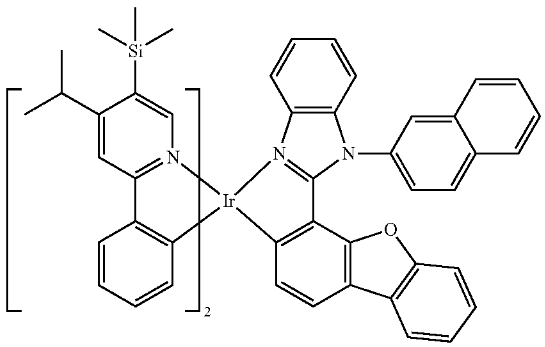
62
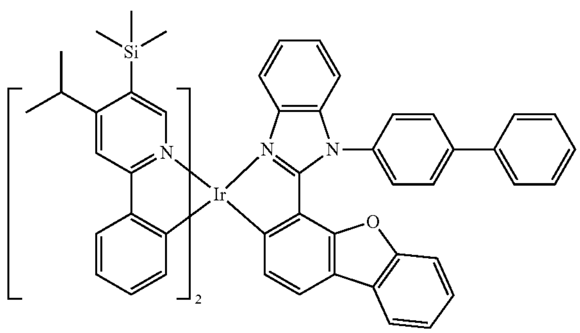
63
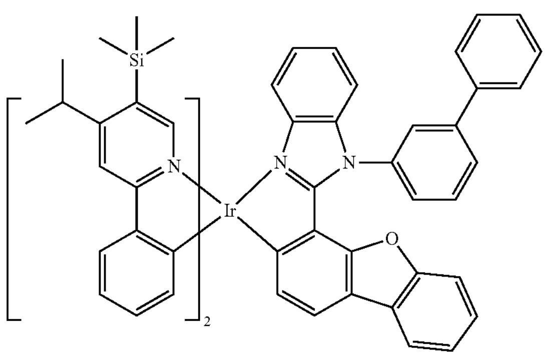
64
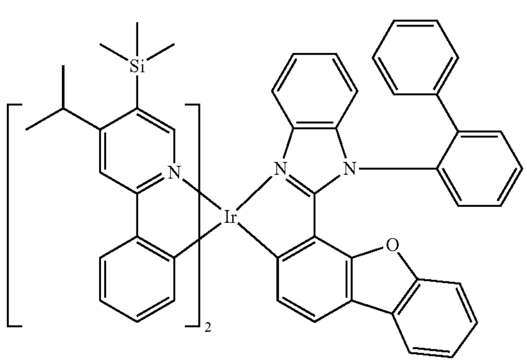
-continued
65
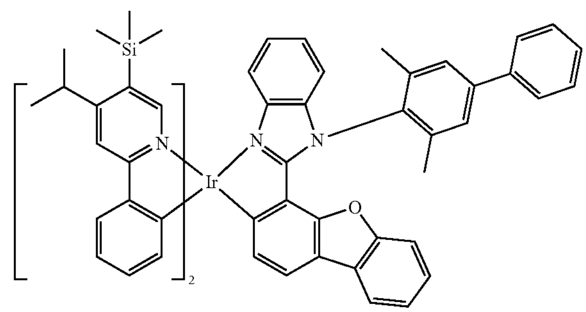
66
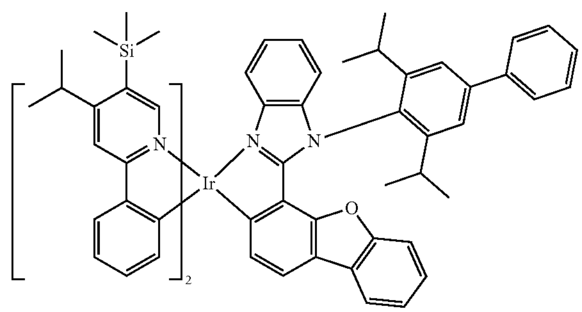
67
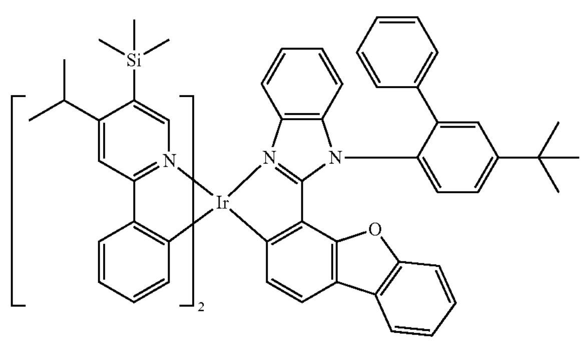
68
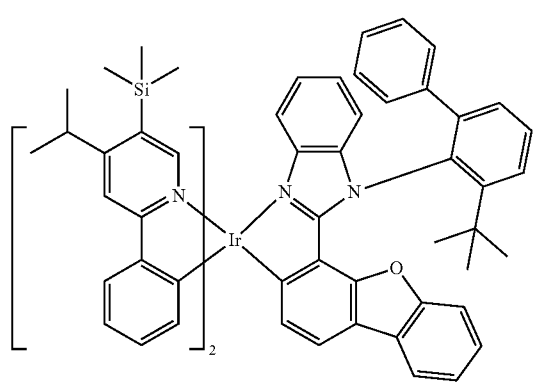

69
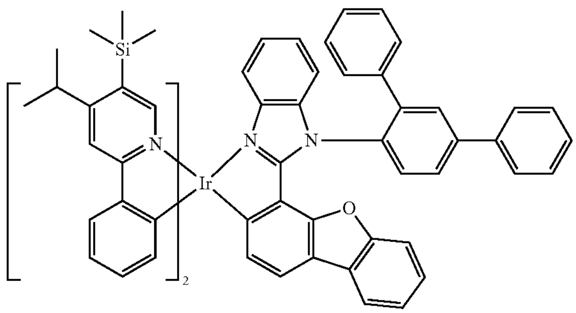
70
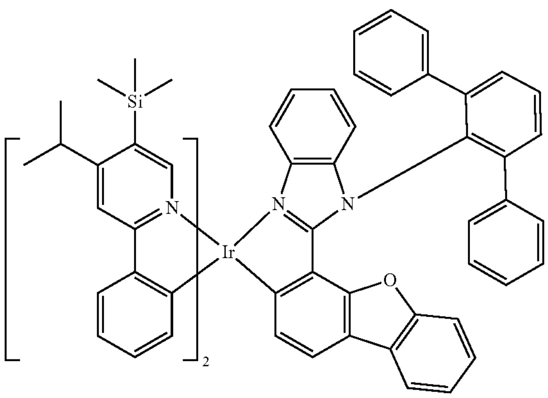
71
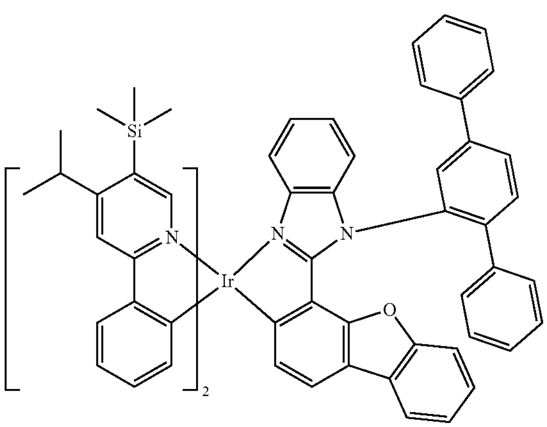
72
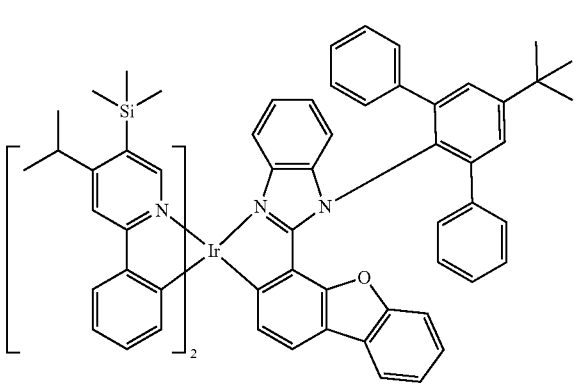
73
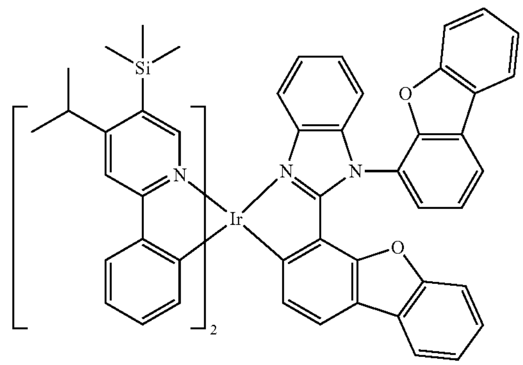
74
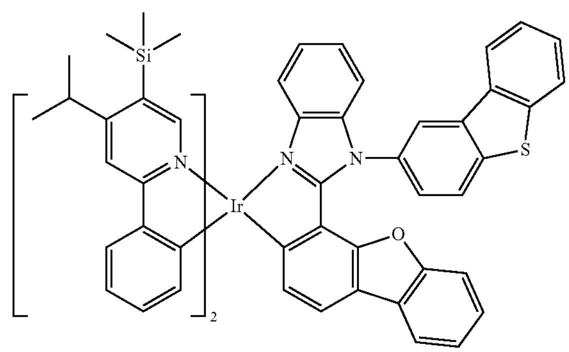
75
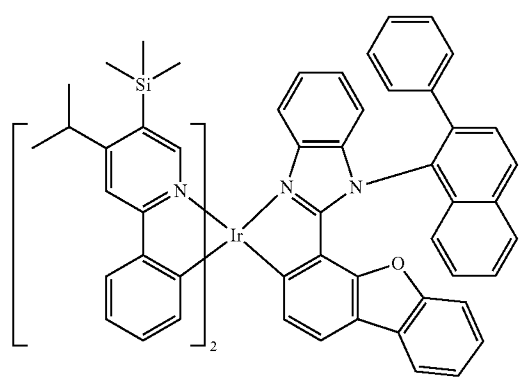
76
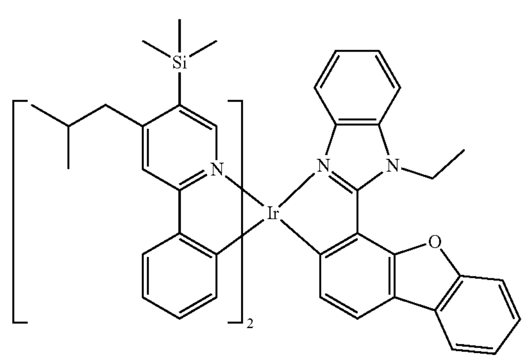

-continued
77
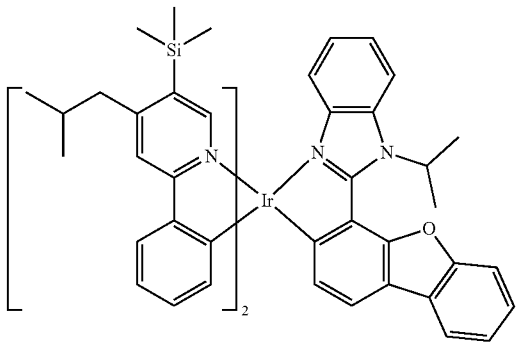
78
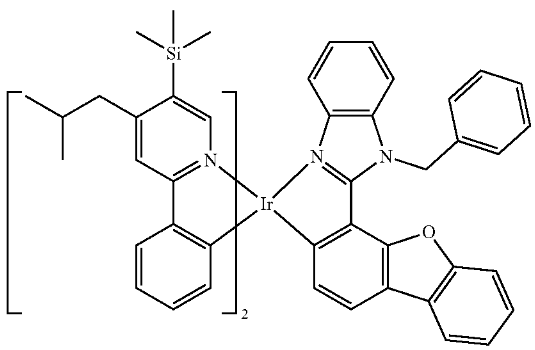
79
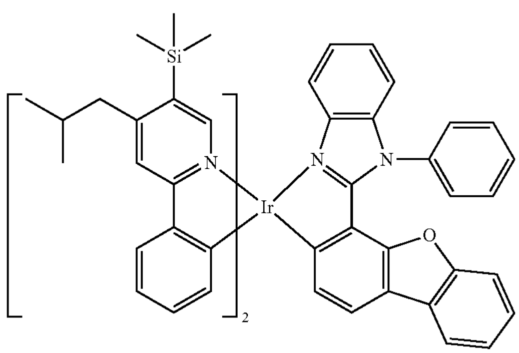
80
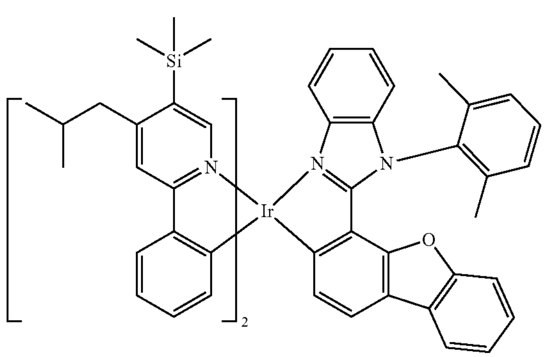
-continued
81
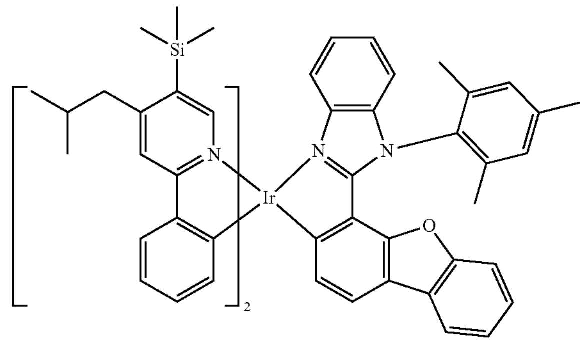
82
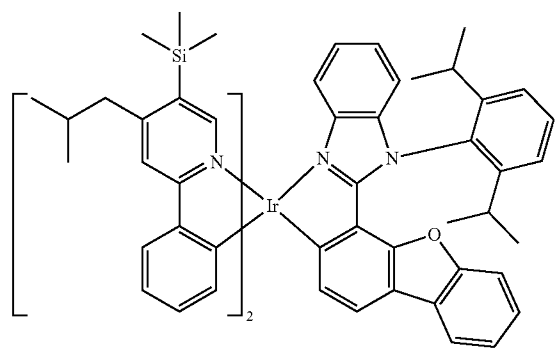
83
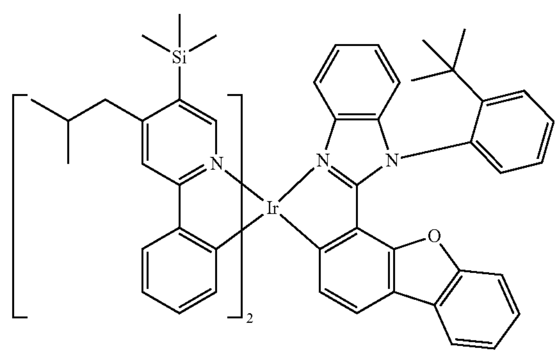
84
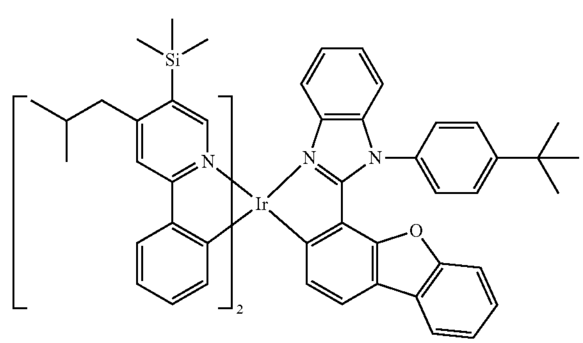

85
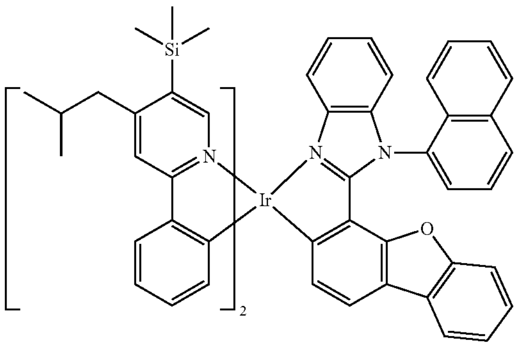
86
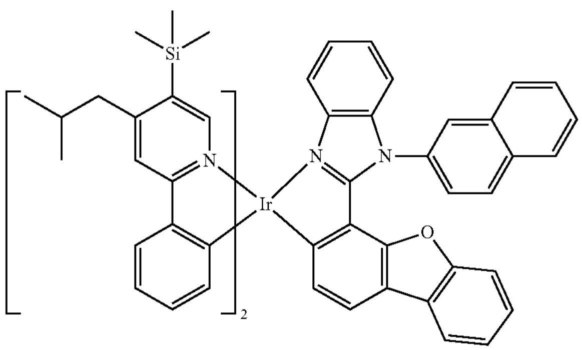
87
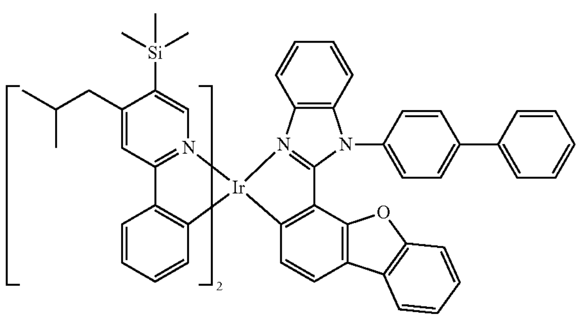
88
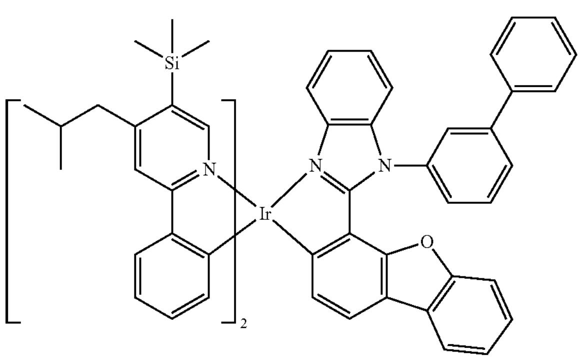
89
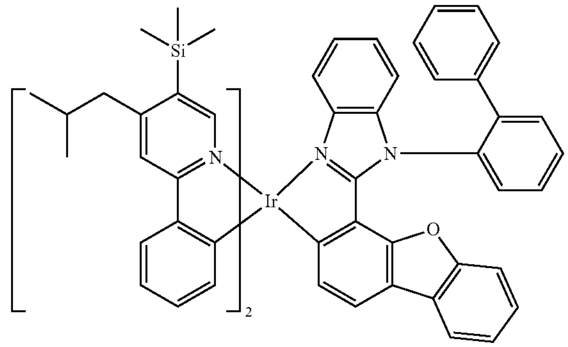
90
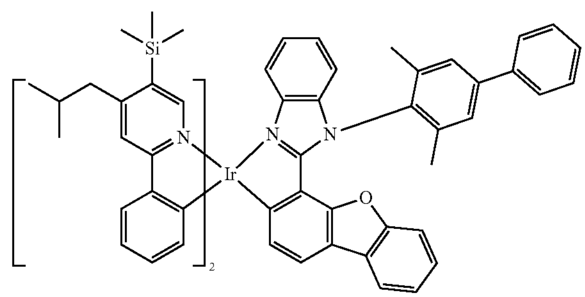
91
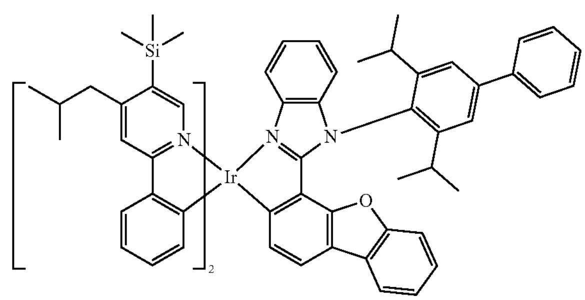
92
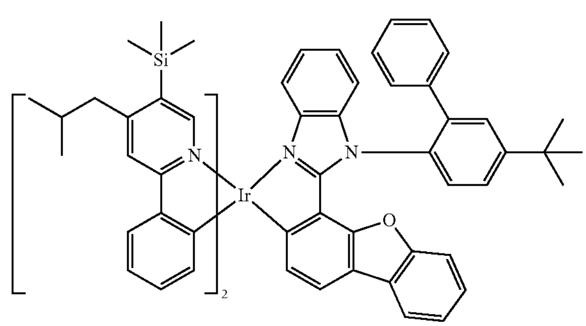

-continued
93
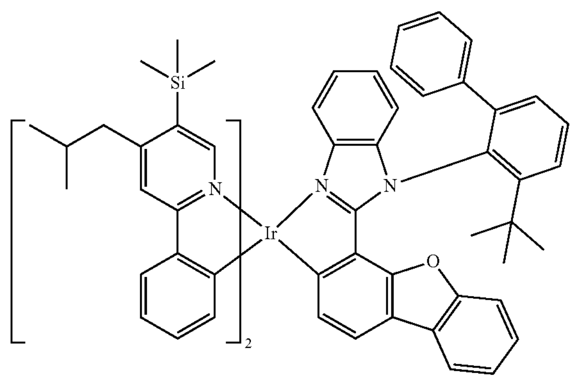
94
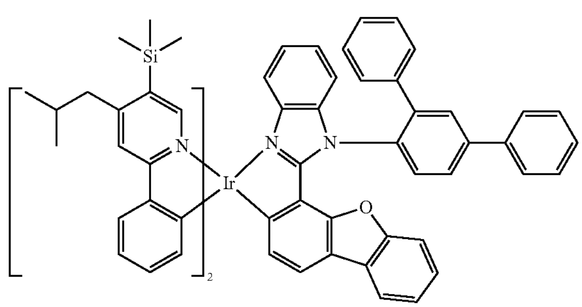
95
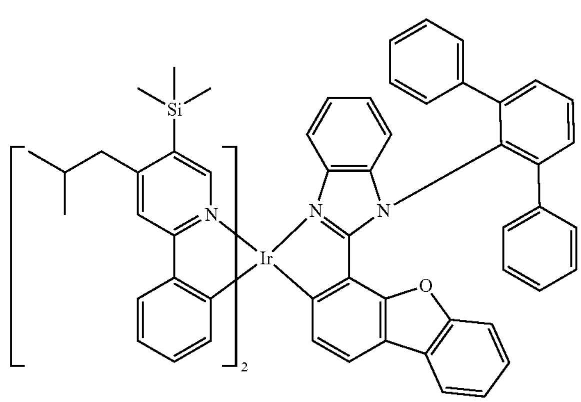
96
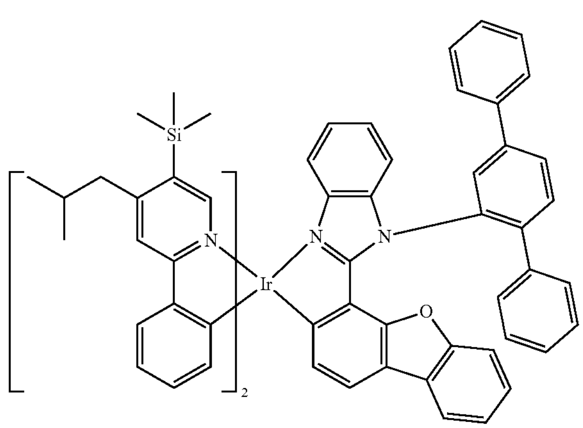
-continued
97
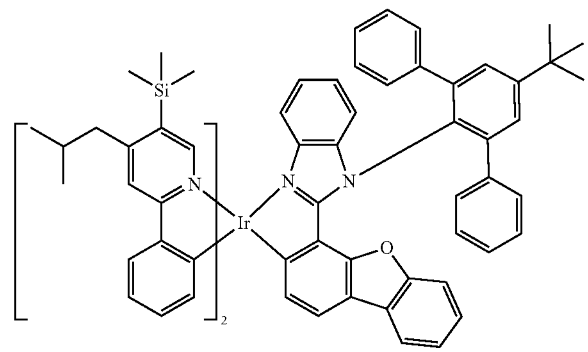
98
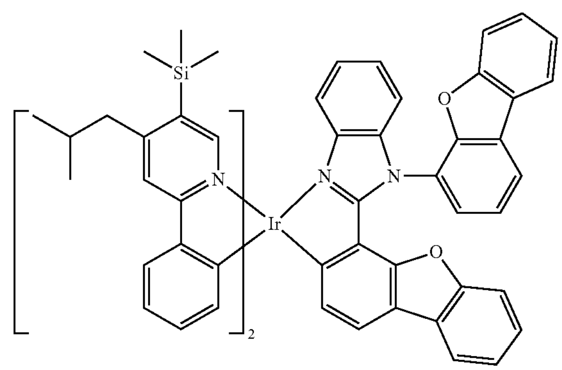
99
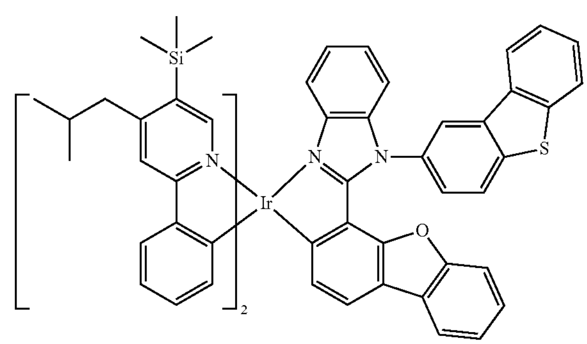
100
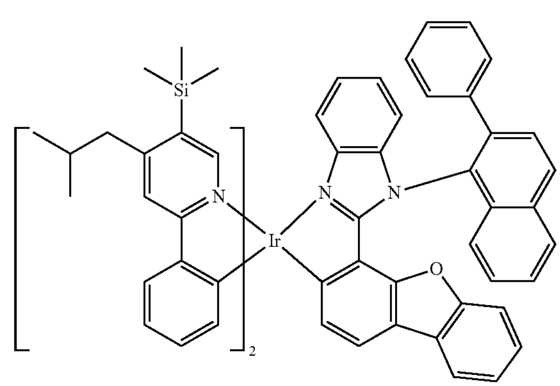

101
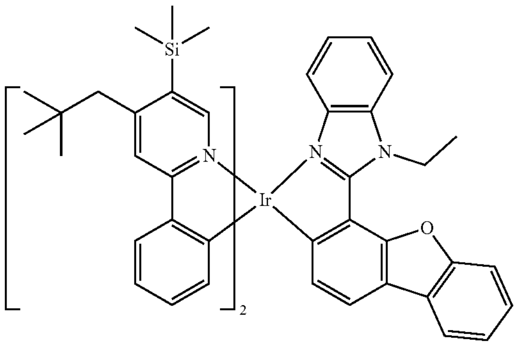
102
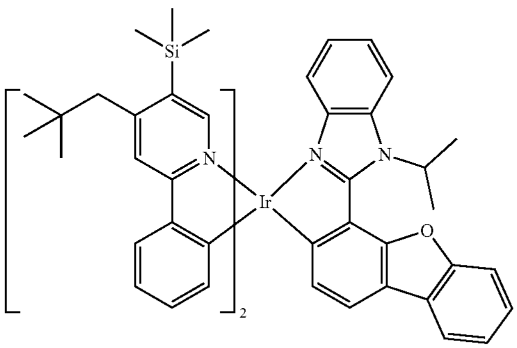
103
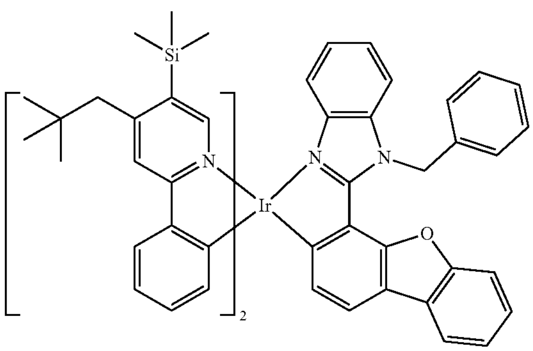
104
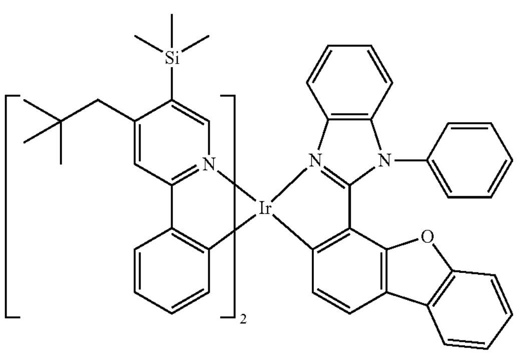
105
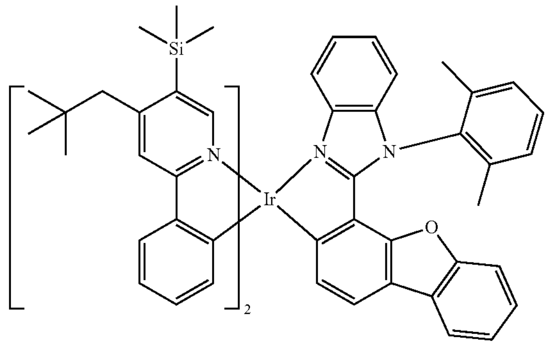
106
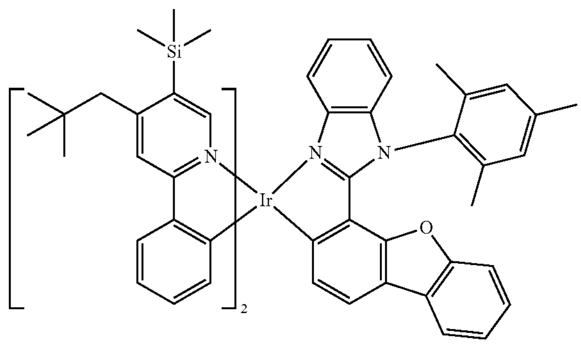
107
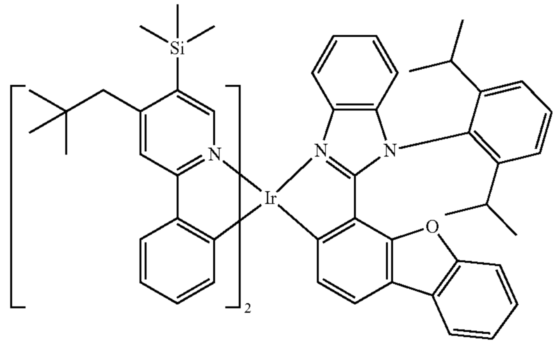
108
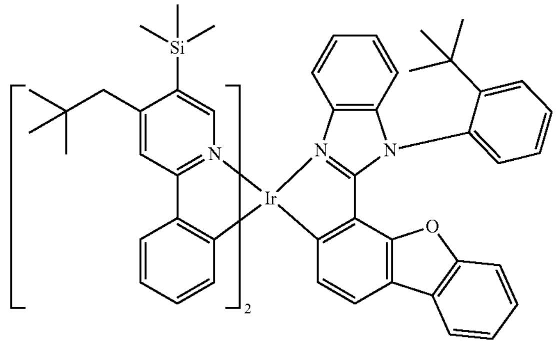

109
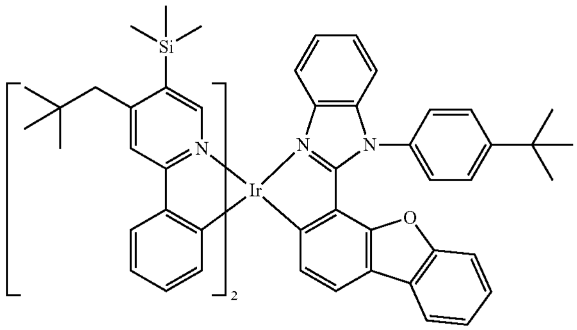
110
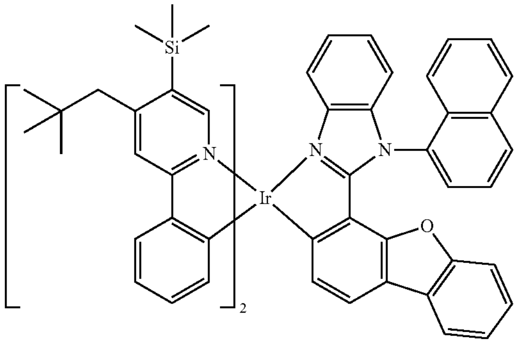
111
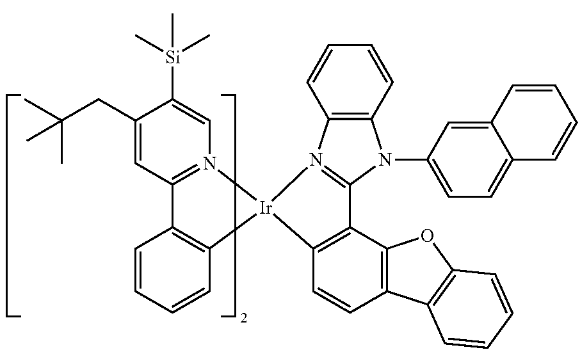
112
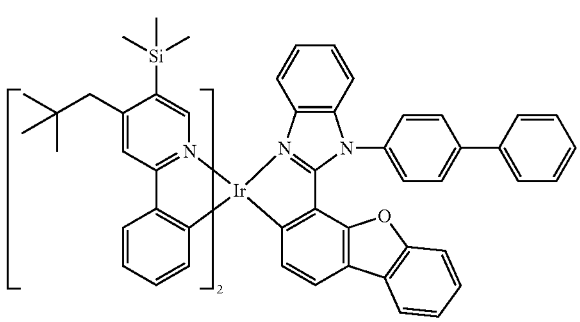
113
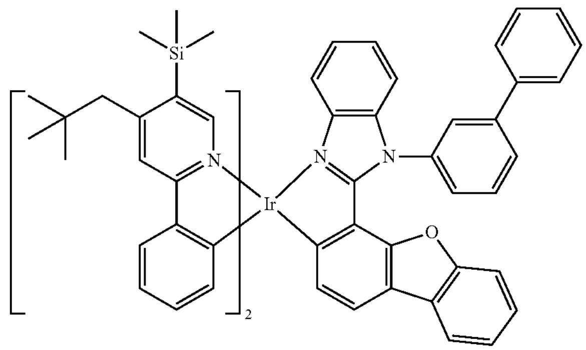
114
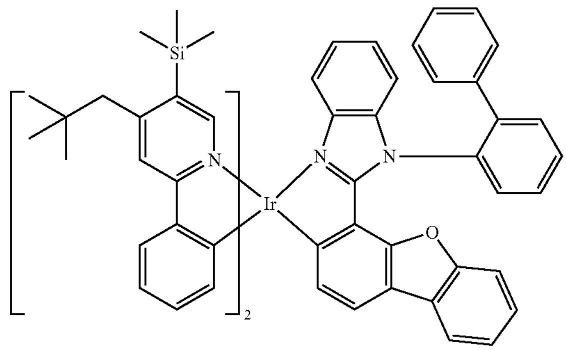
115
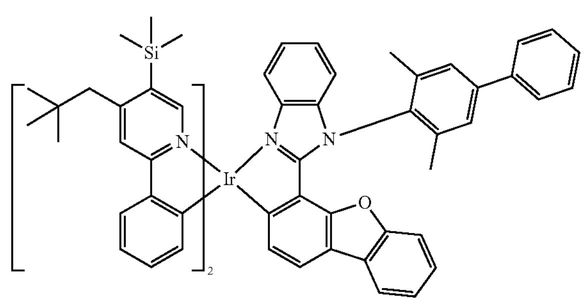
116
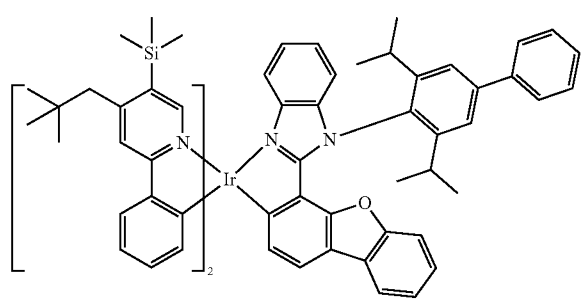

-continued
117
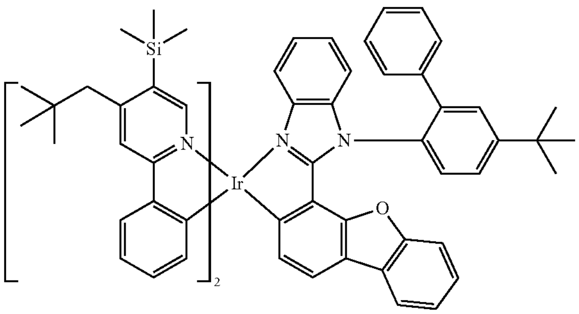
118
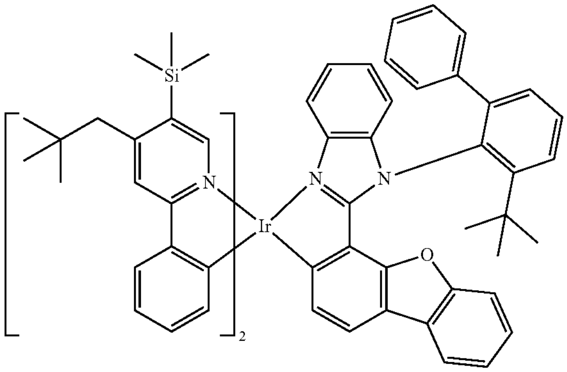
119
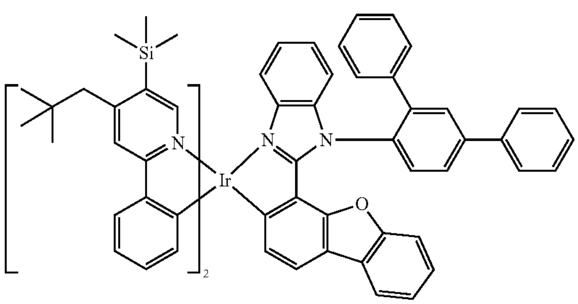
120
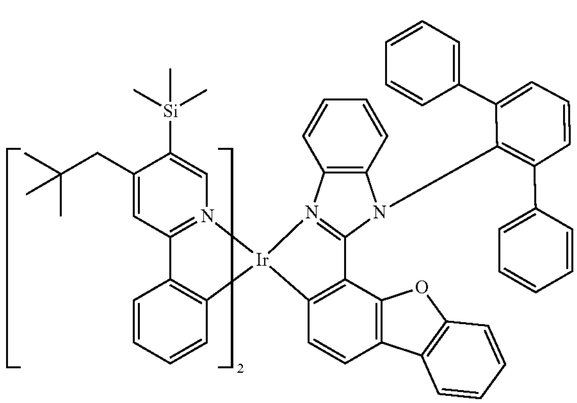
-continued
121
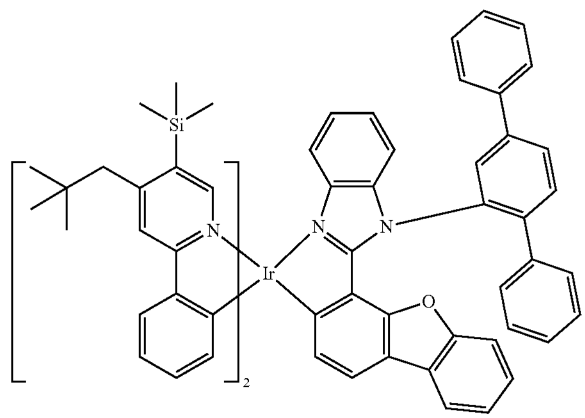
122
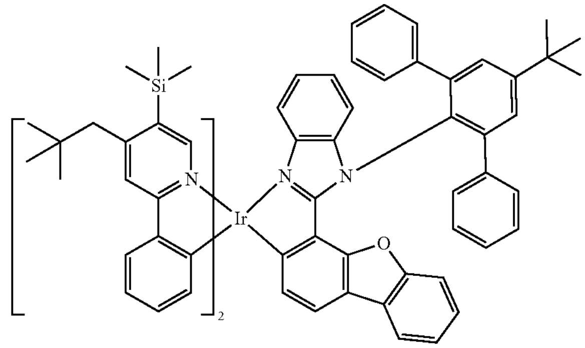
123
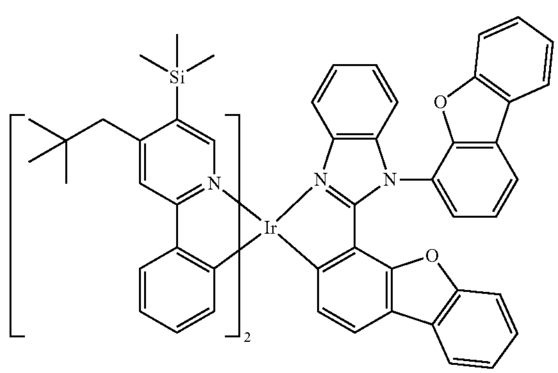
124
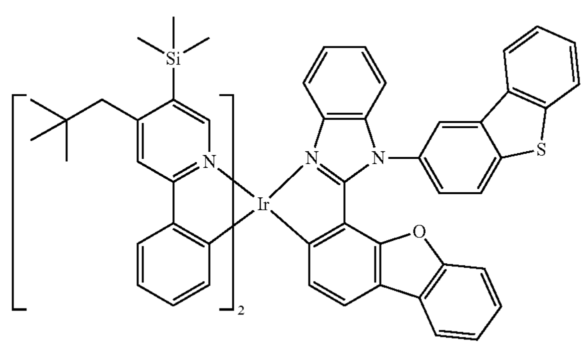

-continued
125
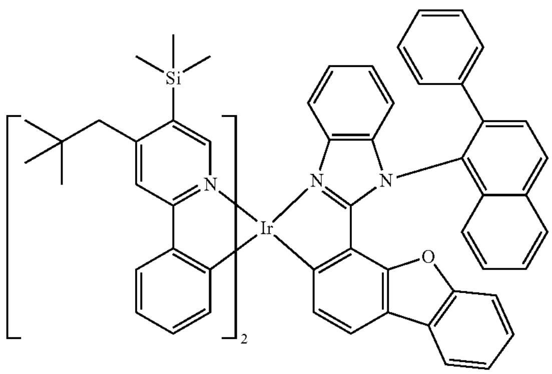
126
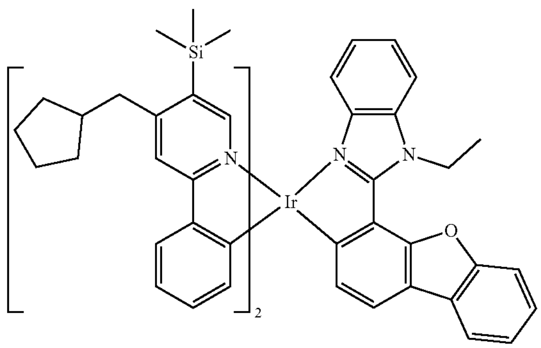
127
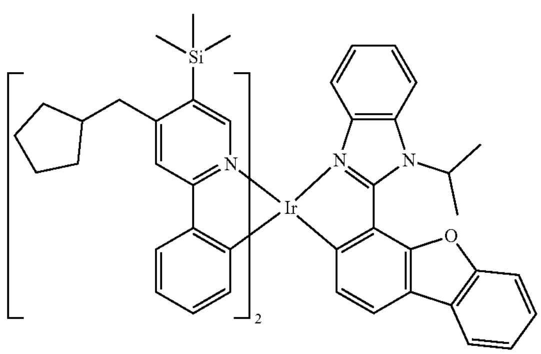
128
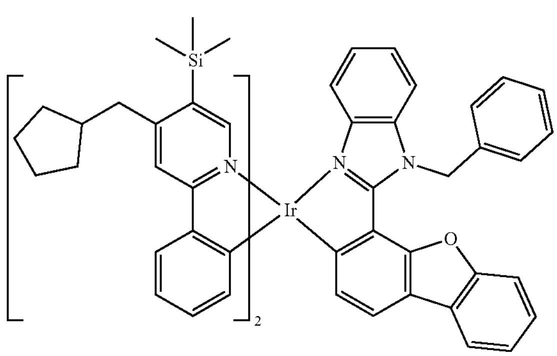
-continued
129
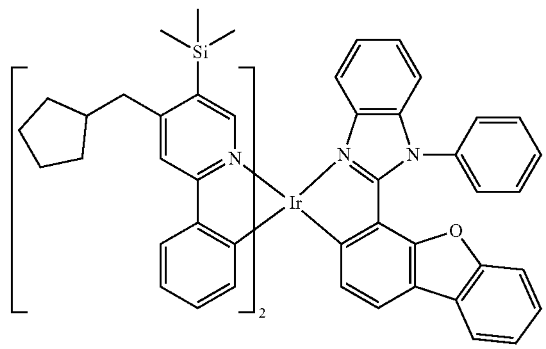
130
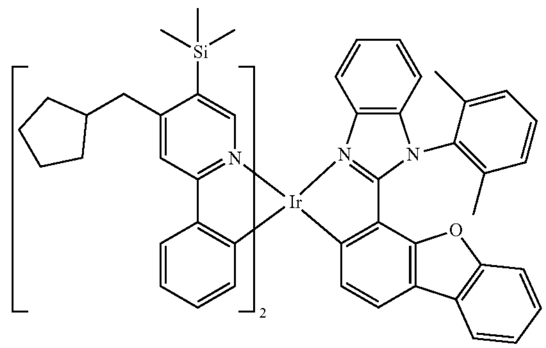
131
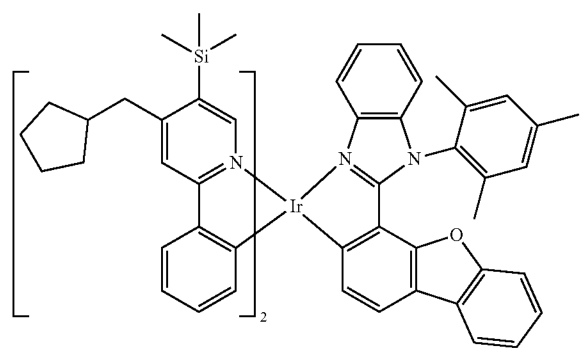
132
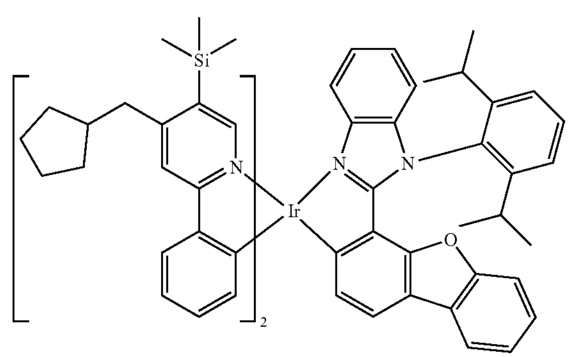

-continued
133
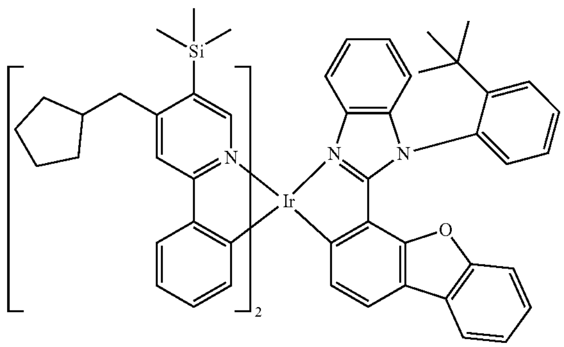
134
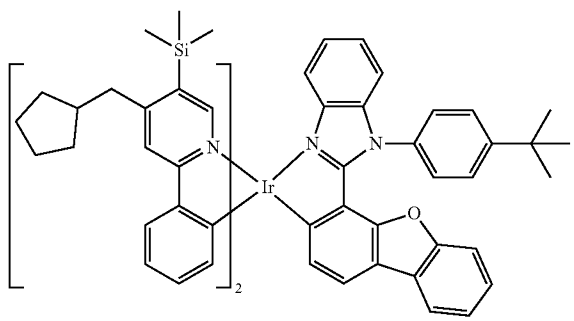
135
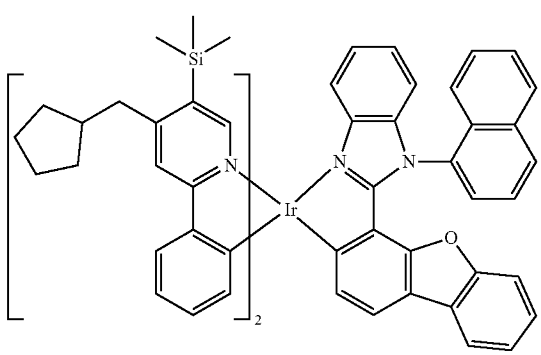
136
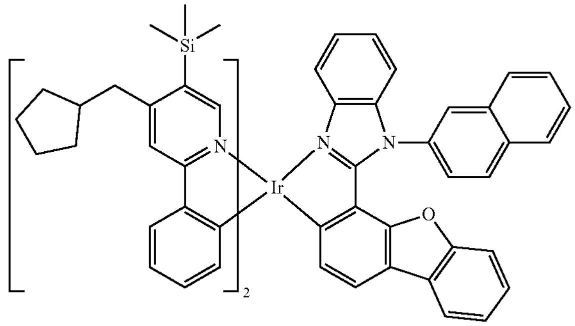
-continued
137
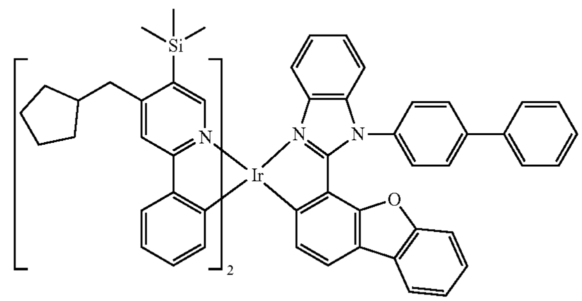
138
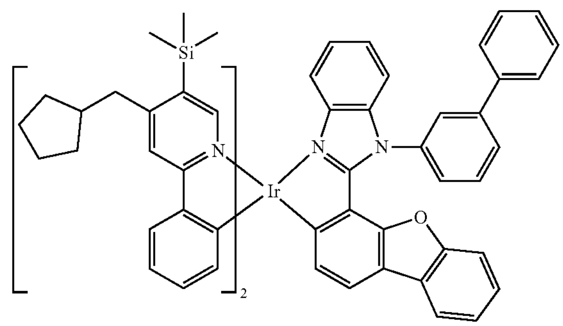
139
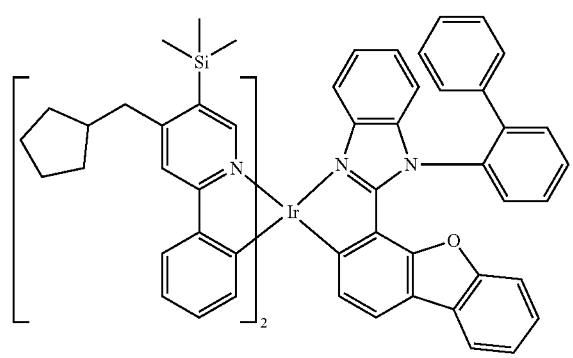
140
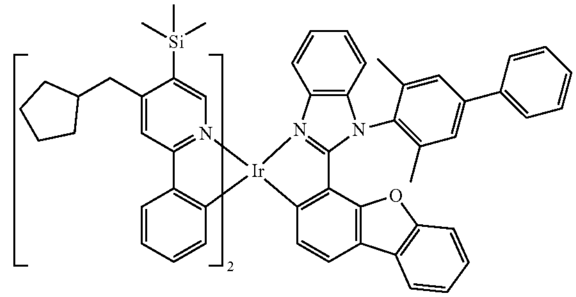

141
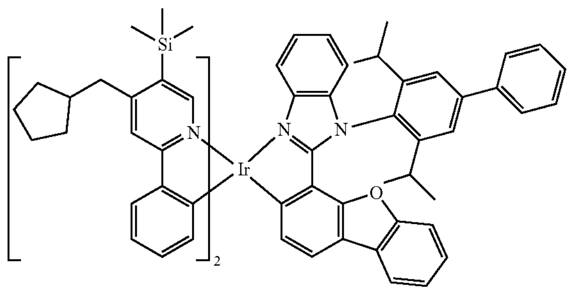
142
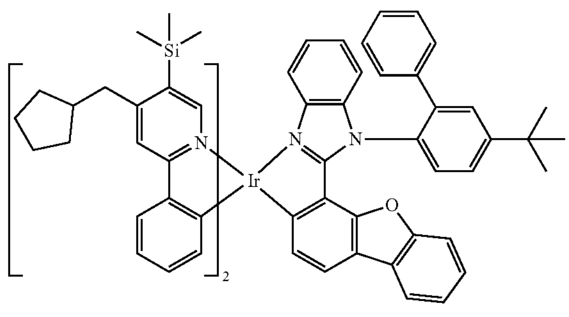
143
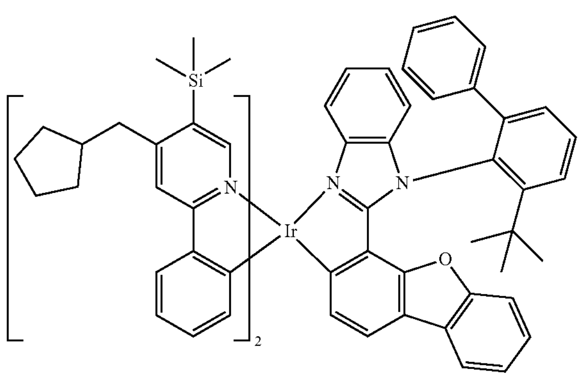
144
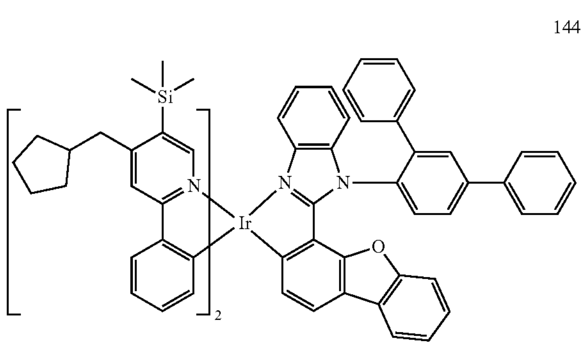
145
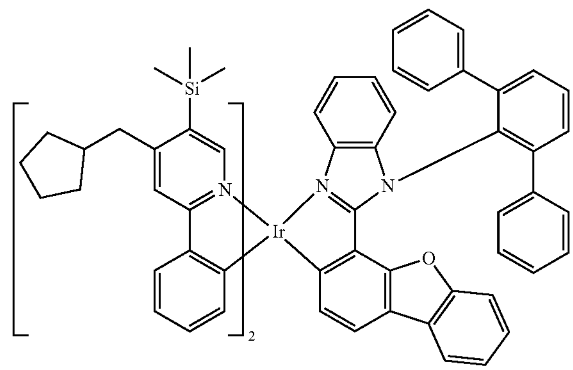
146
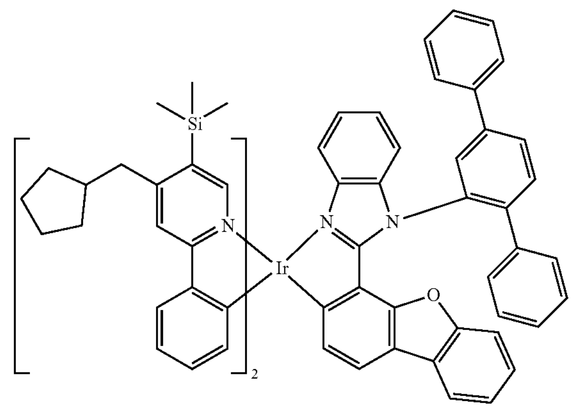
147
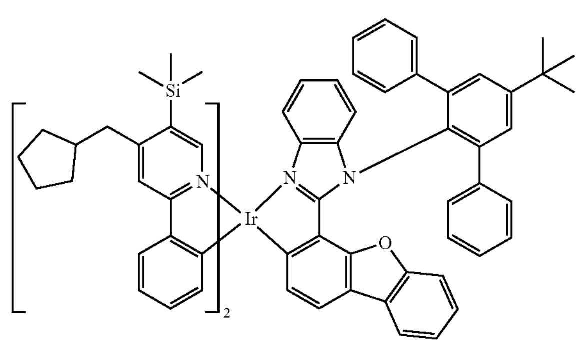
148
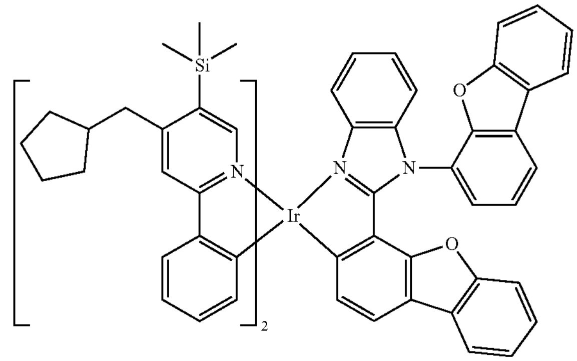

-continued
149
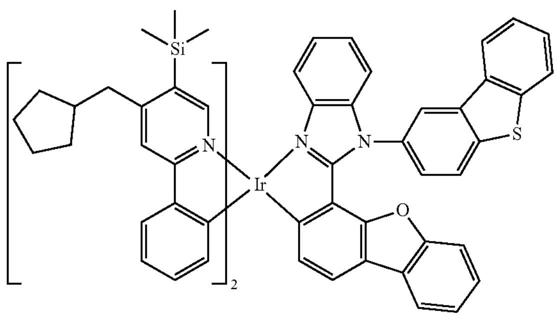
150
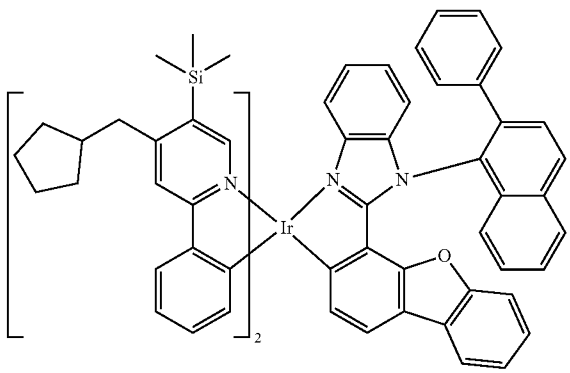
151
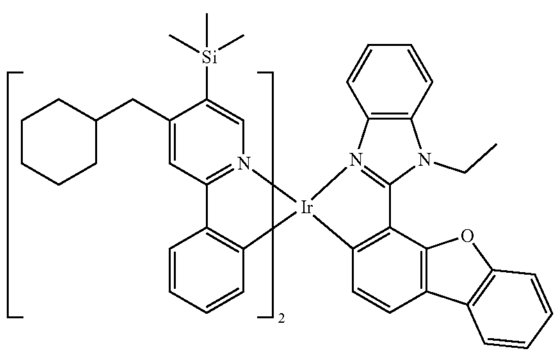
152
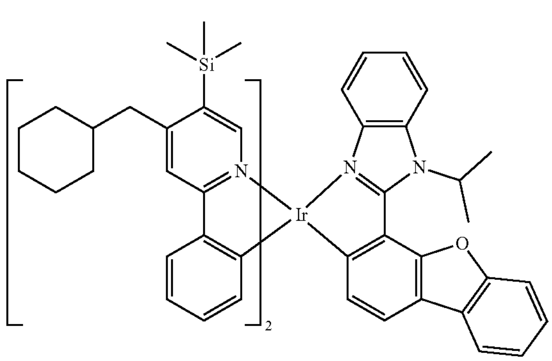
-continued
153
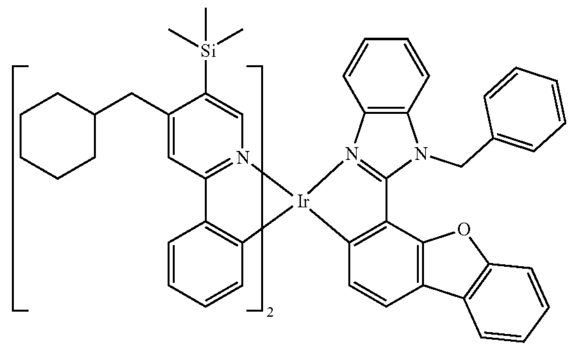
154
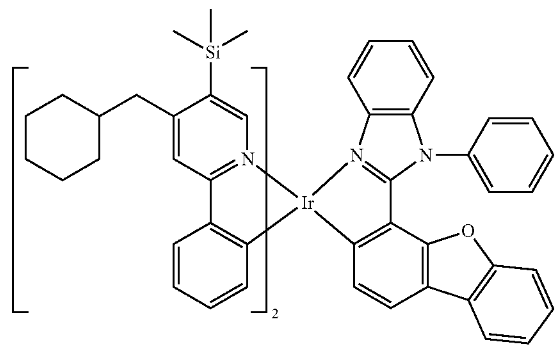
155
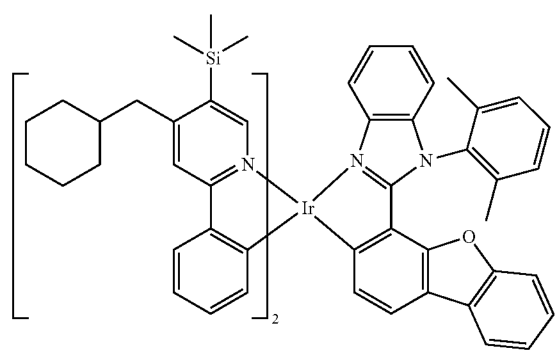
156
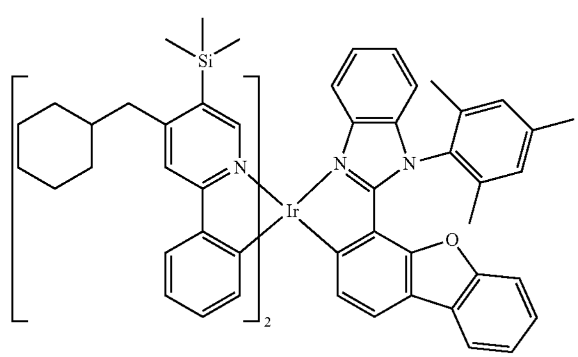

157
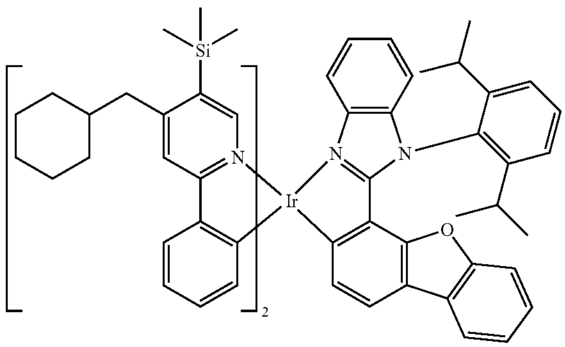
158
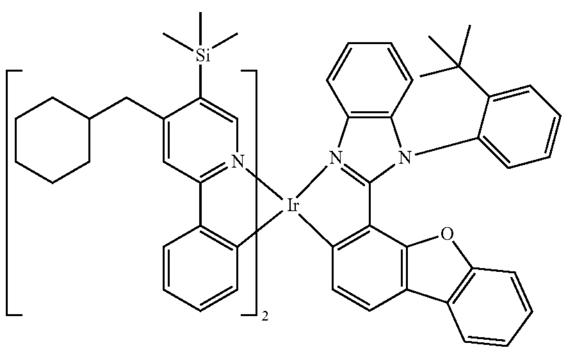
159
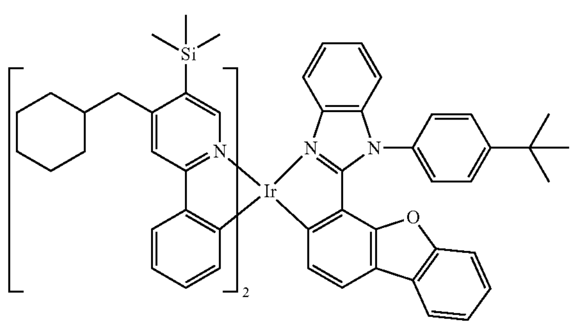
160
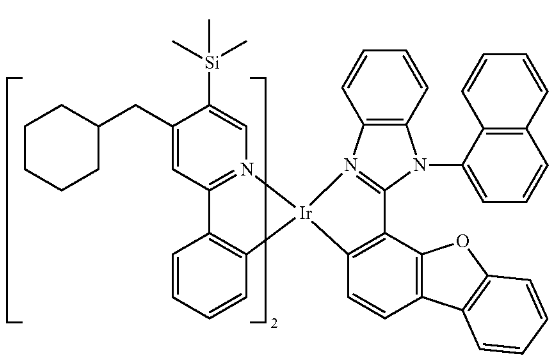
161
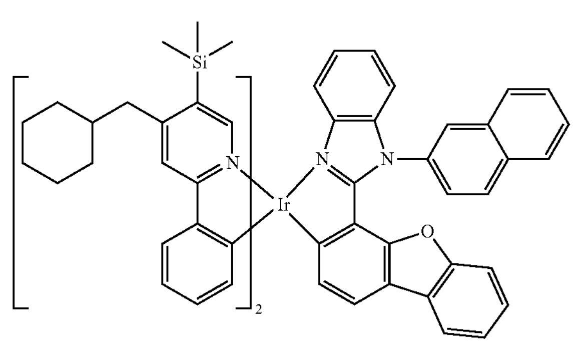
162
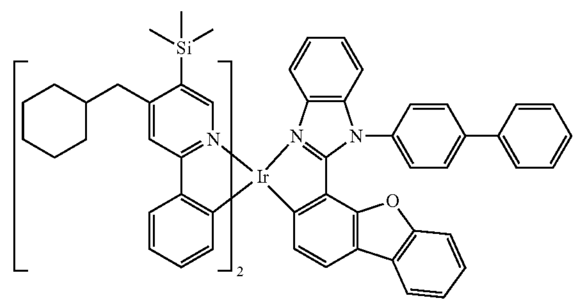
163
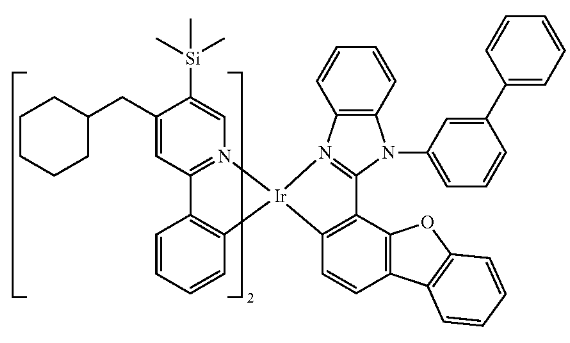
164
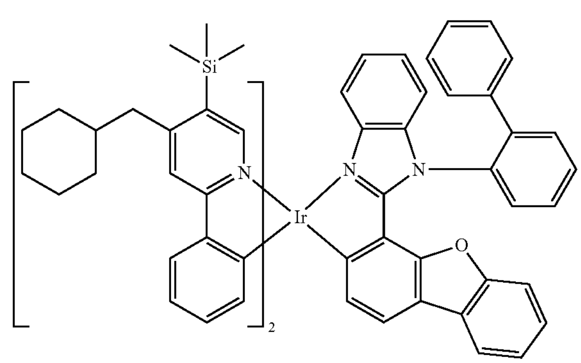

165
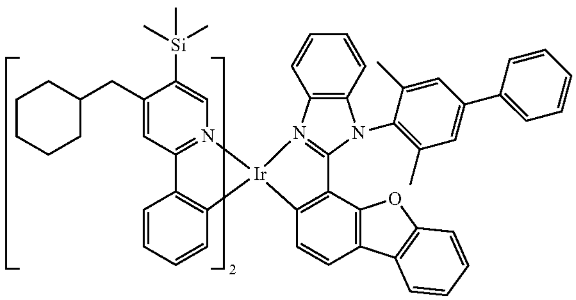
166
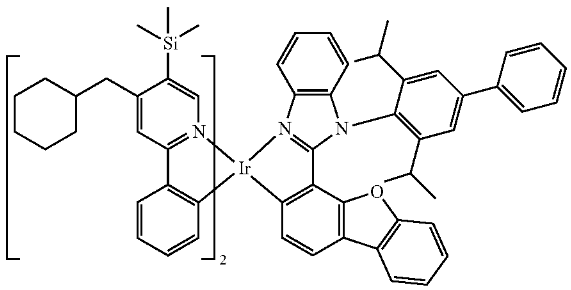
167
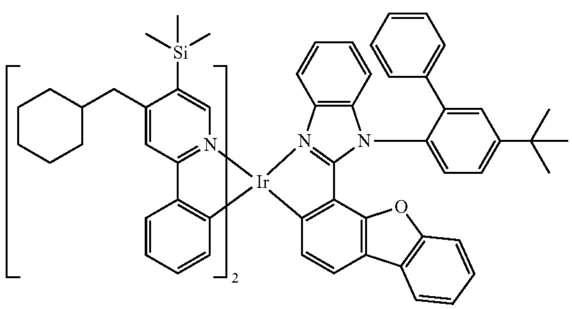
168
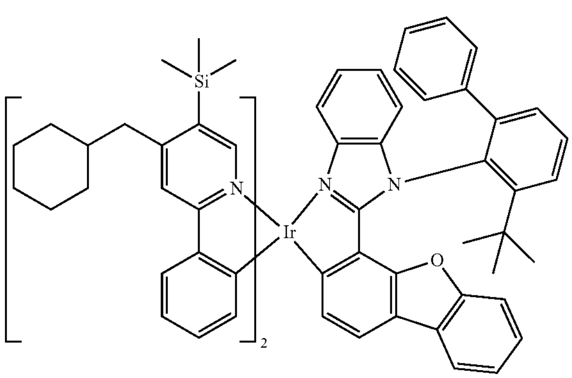
169
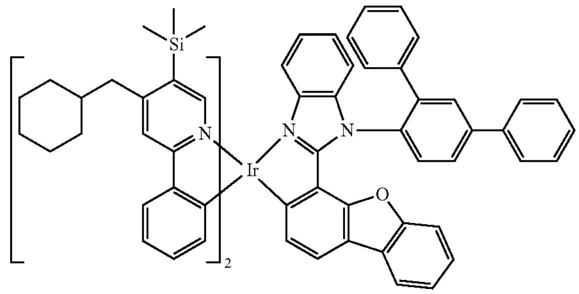
170
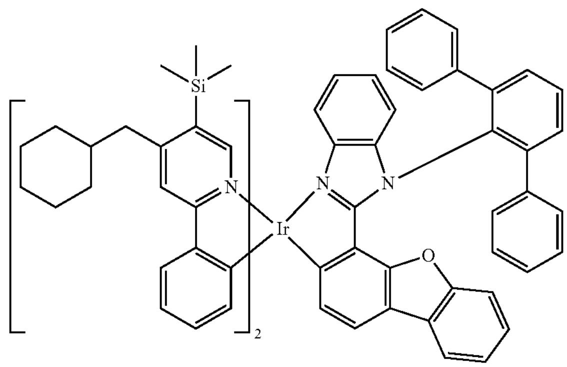
171
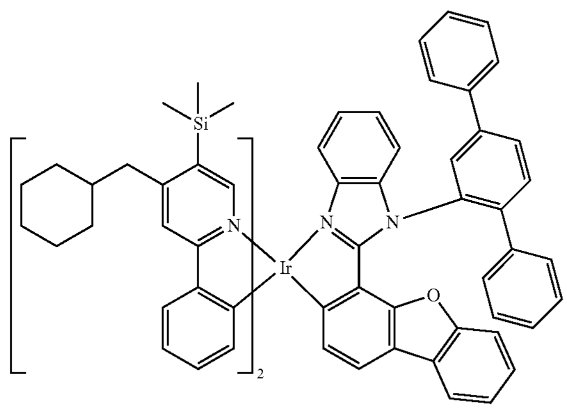
172
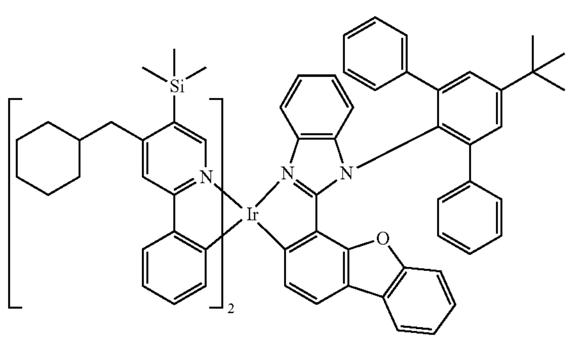

173
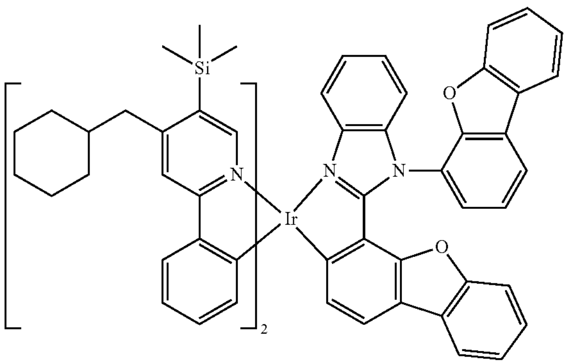
174
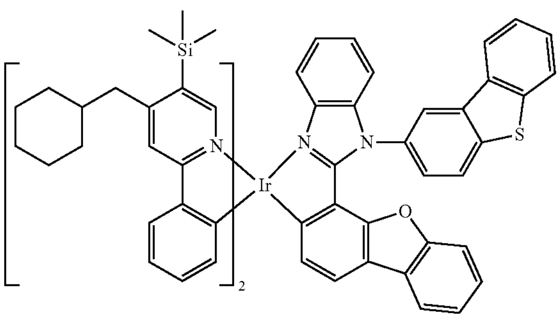
175
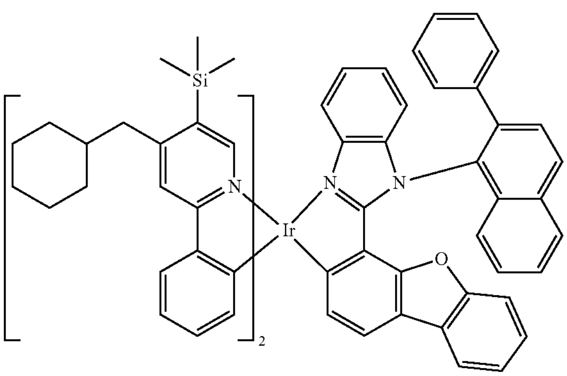
176
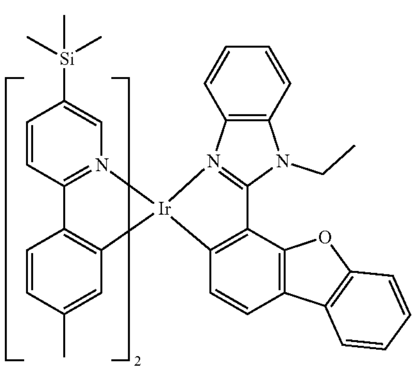
177
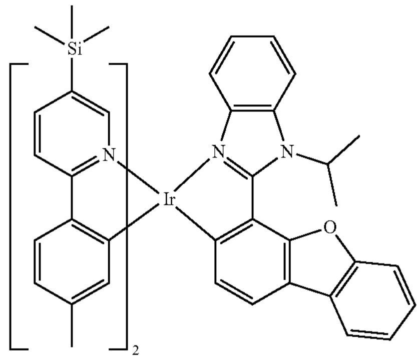
178
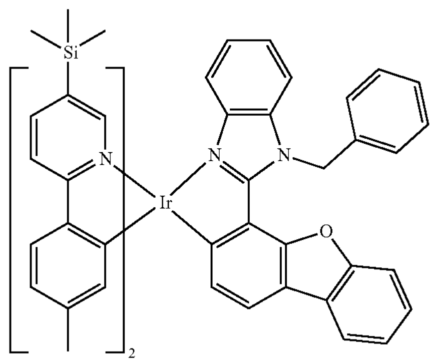
179
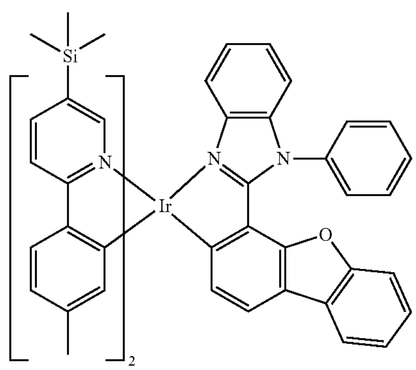
180
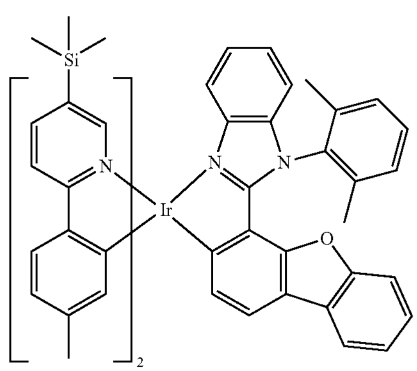

-continued
181
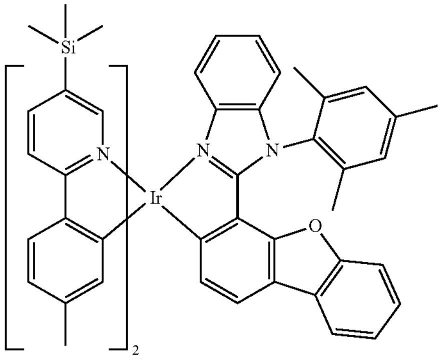
182
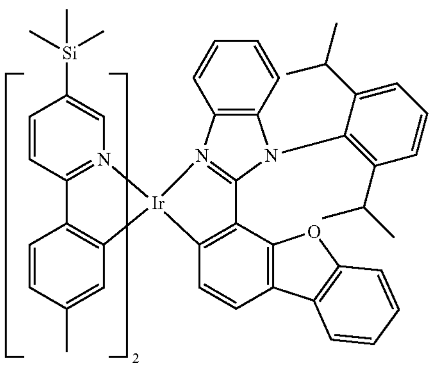
183
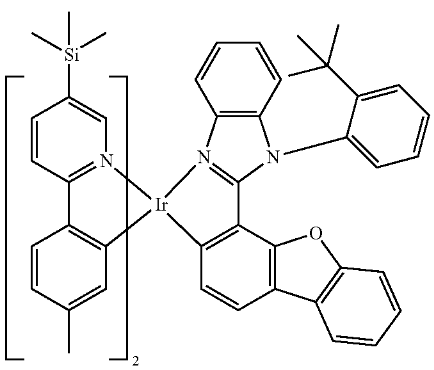
184
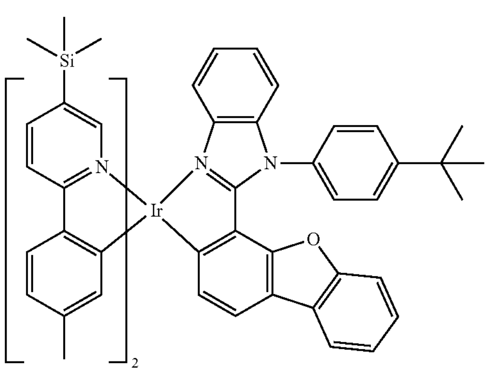
-continued
185
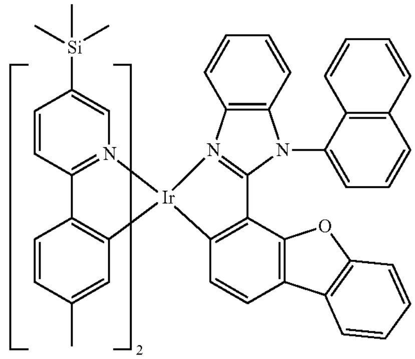
186
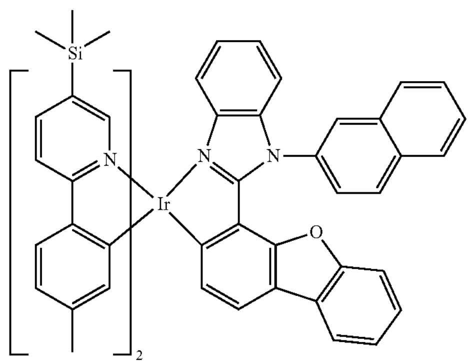
187
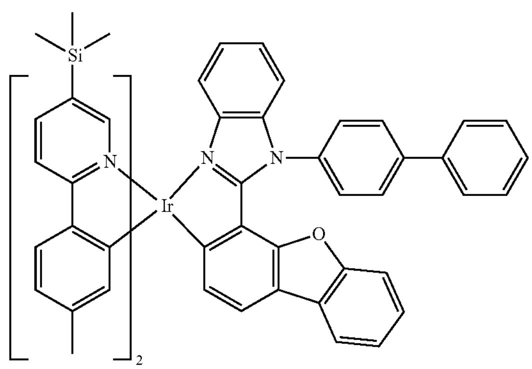
188
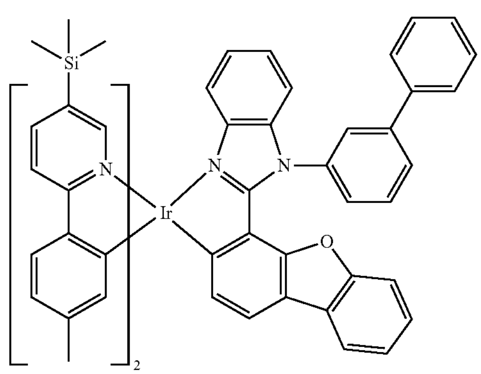

189
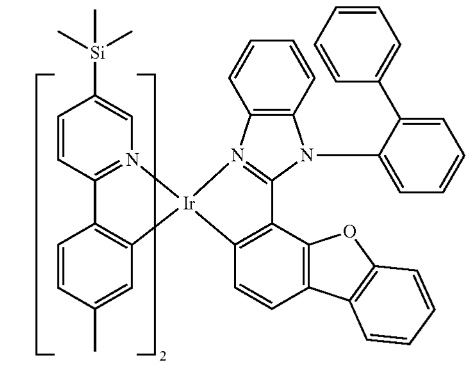
190
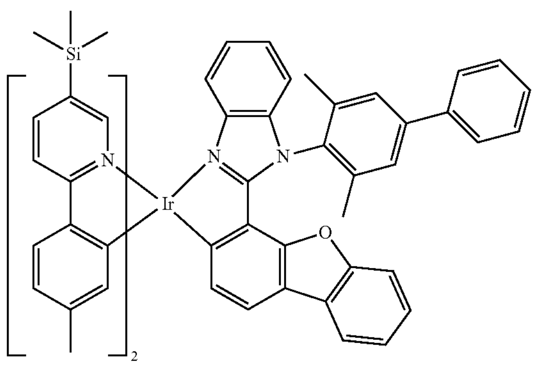
191
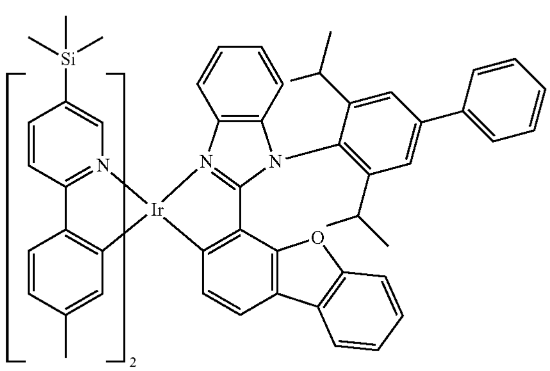
192
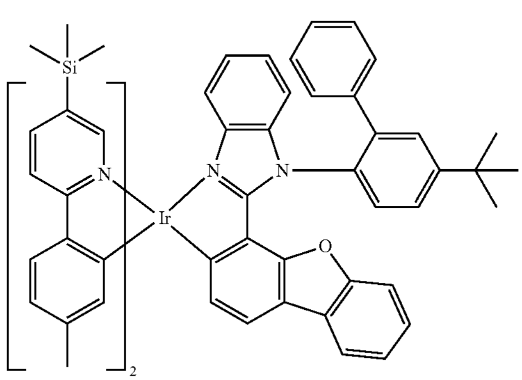
193
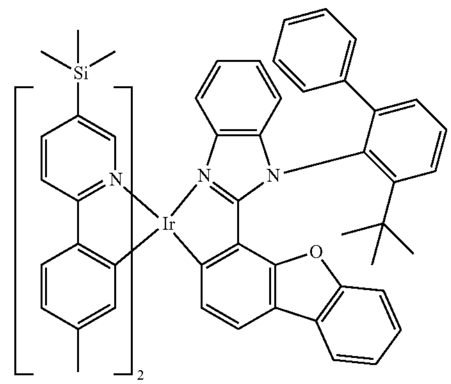
194
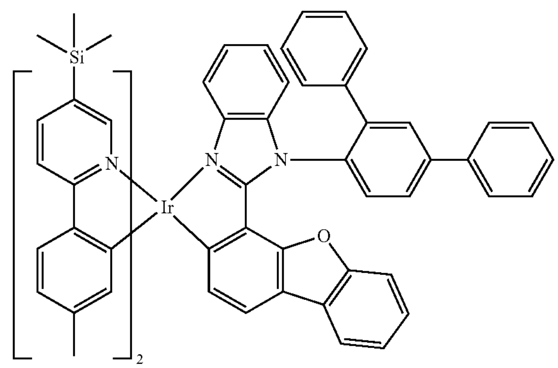
195
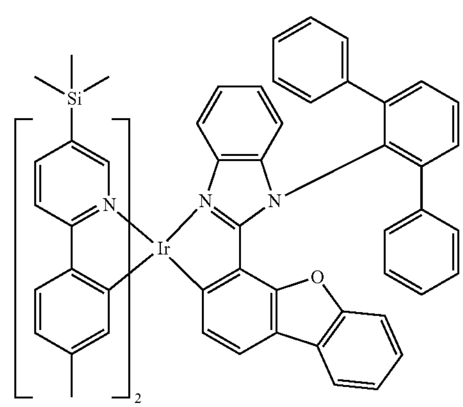
196
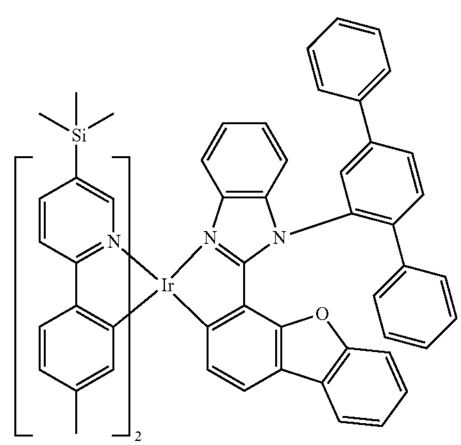

-continued
197
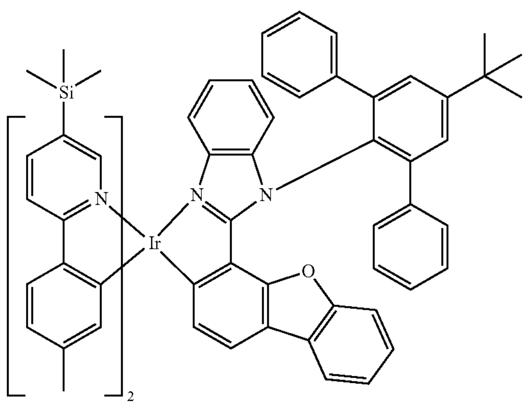
198
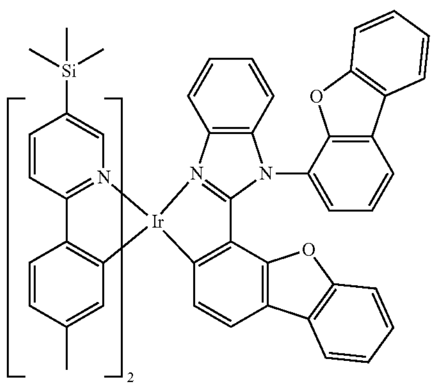
199
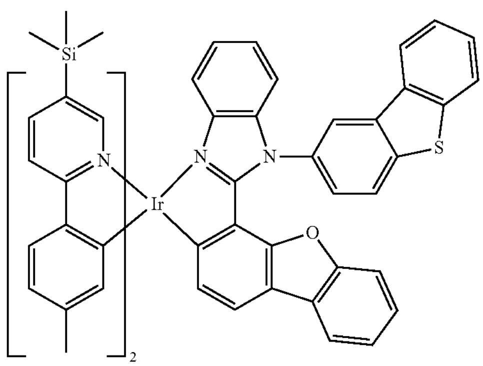
200
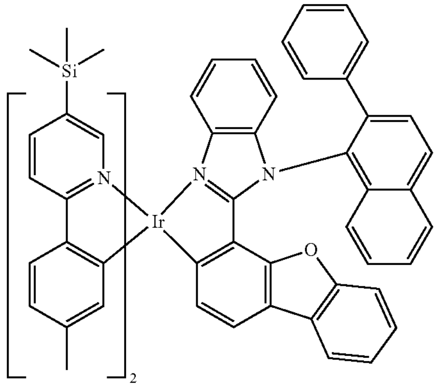
-continued
201
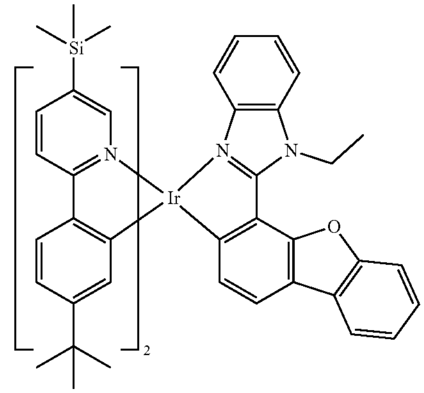
202
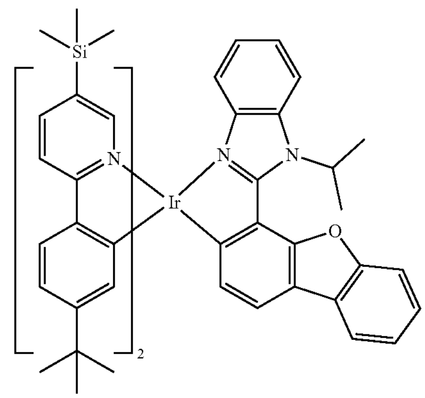
203
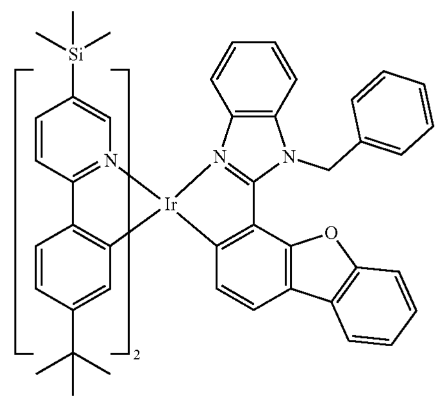
204
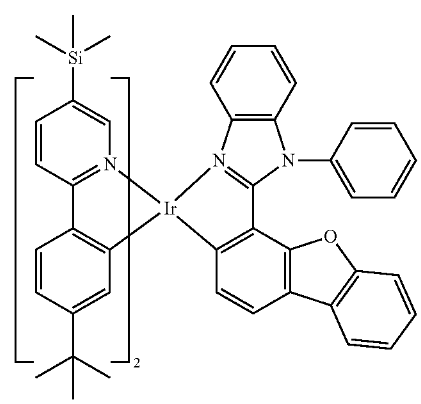

-continued
205
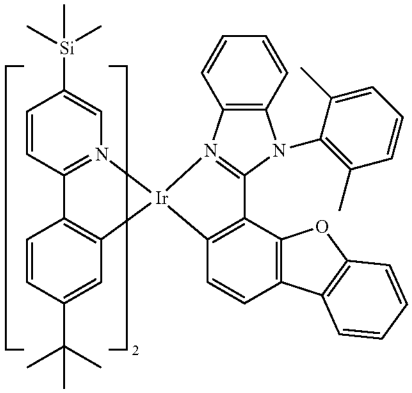
206
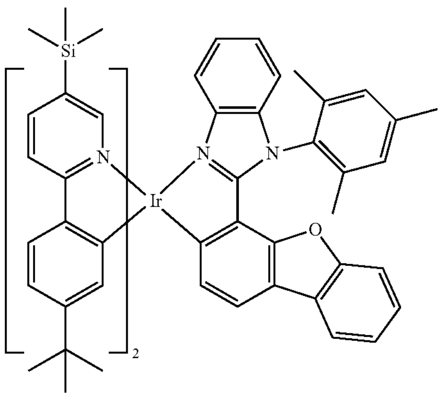
207
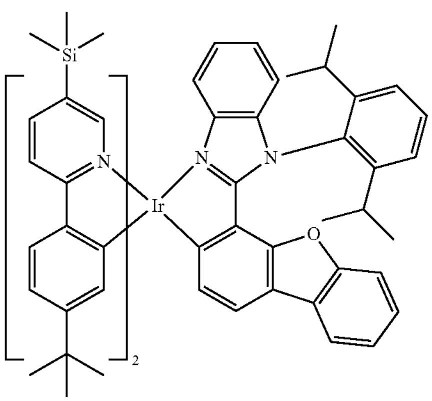
208
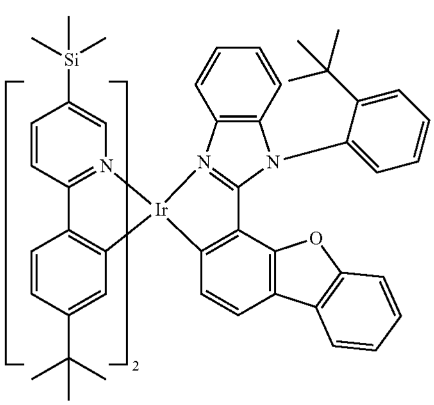
-continued
209
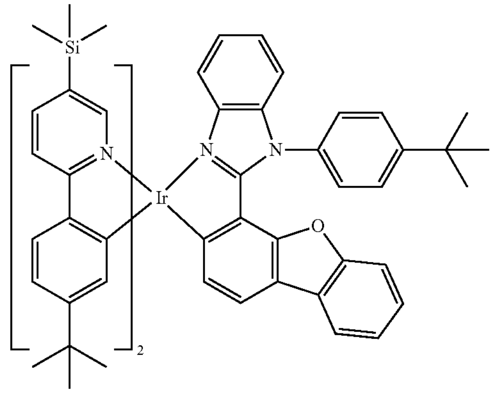
210
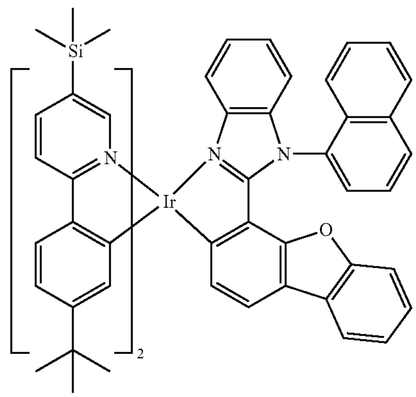
211
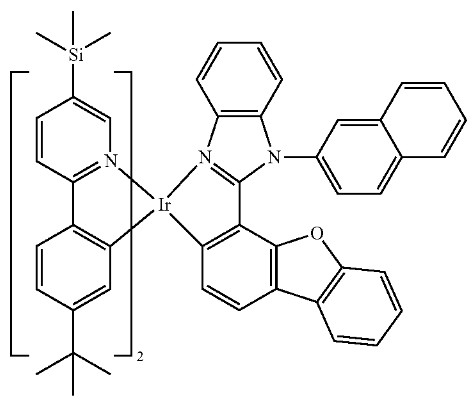
212
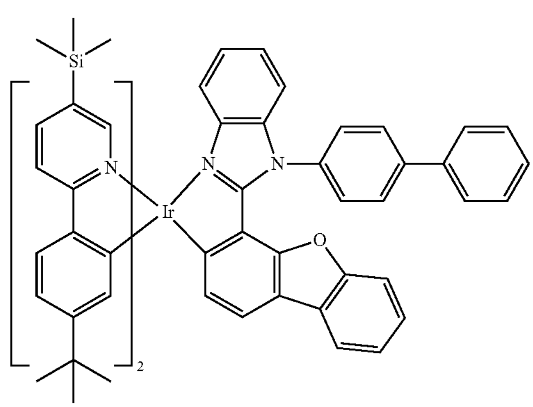

-continued
213
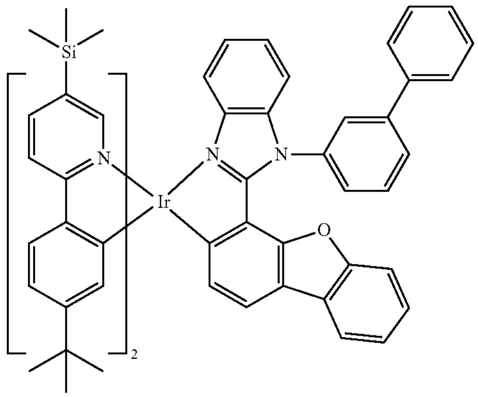
214
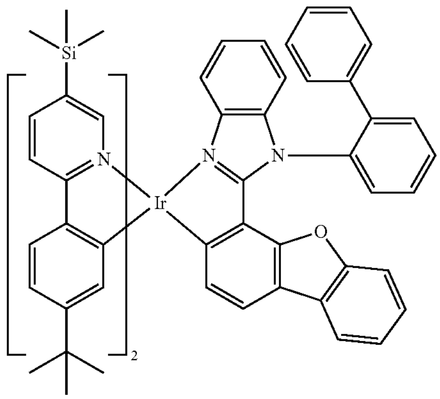
215
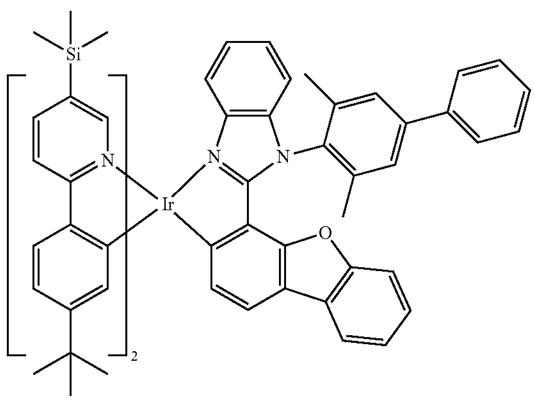
216
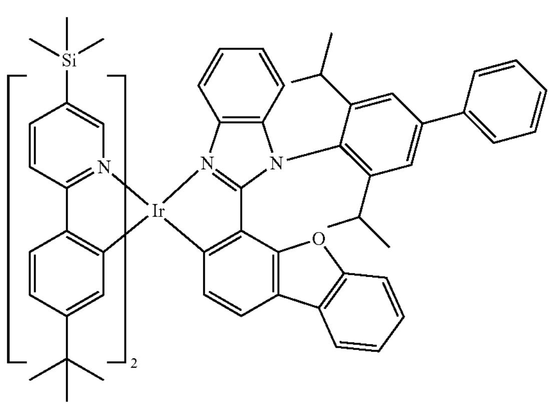
-continued
217
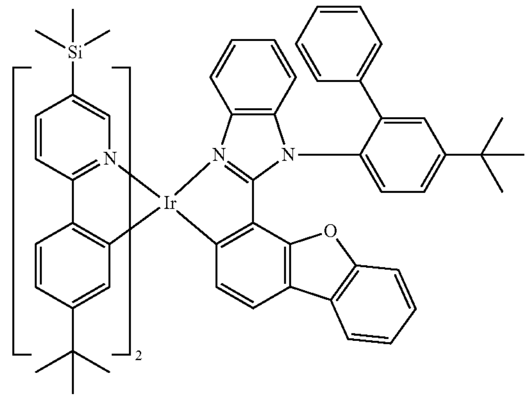
218
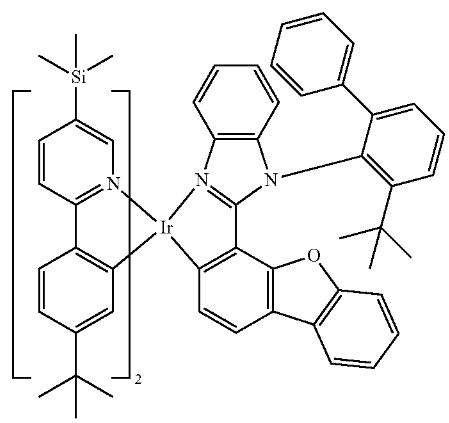
219
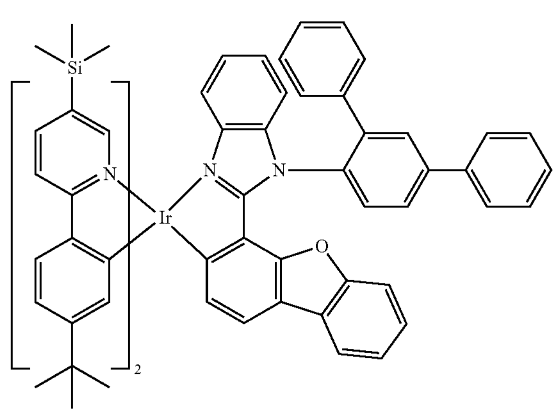

-continued
220
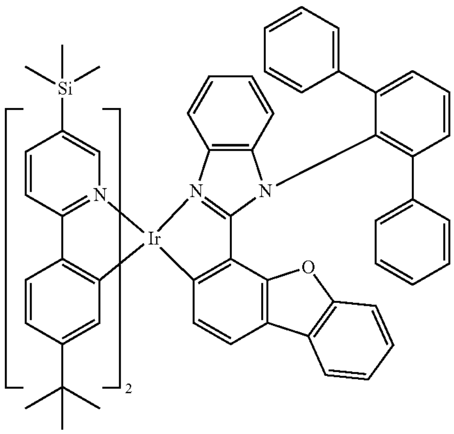
221
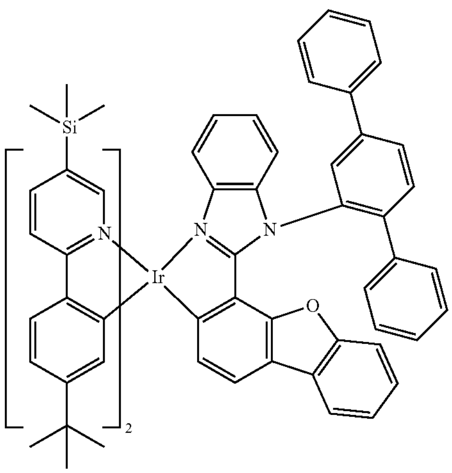
222
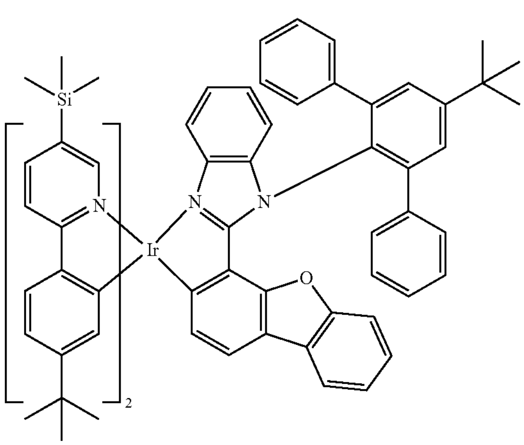
-continued
223
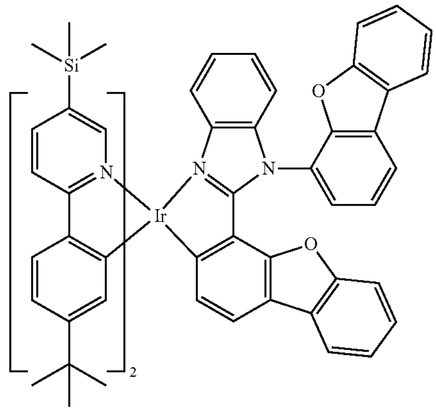
224
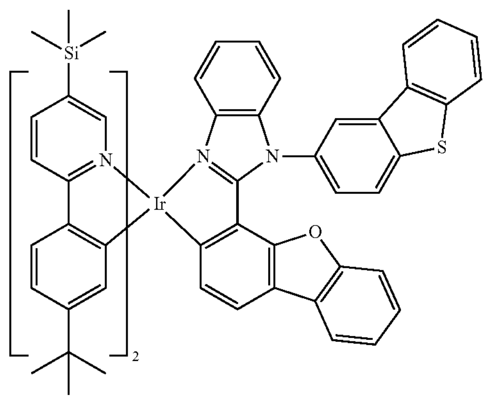
225
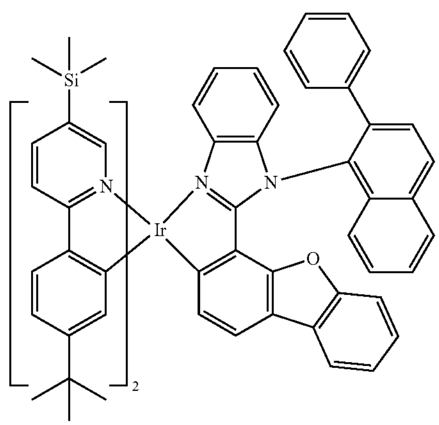
226
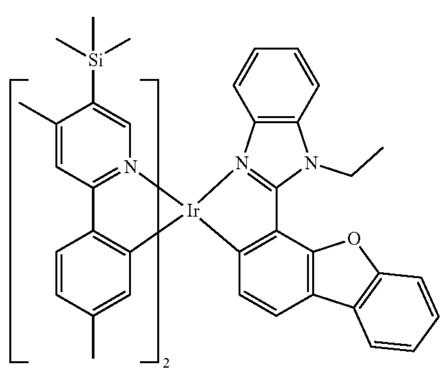

227
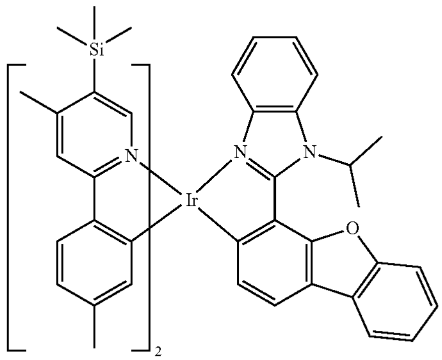
228
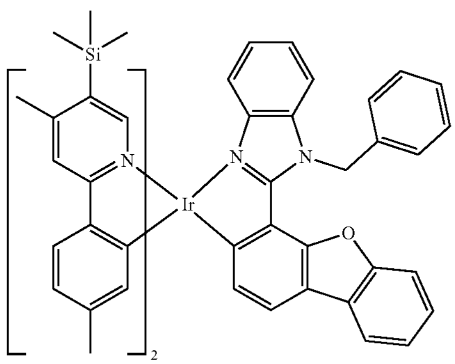
229
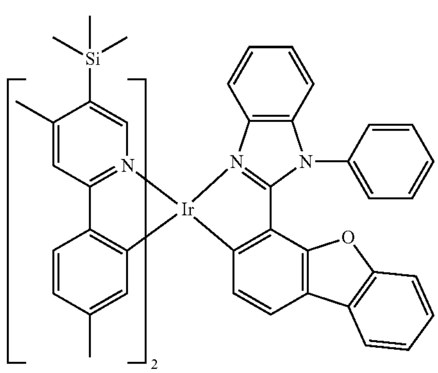
230
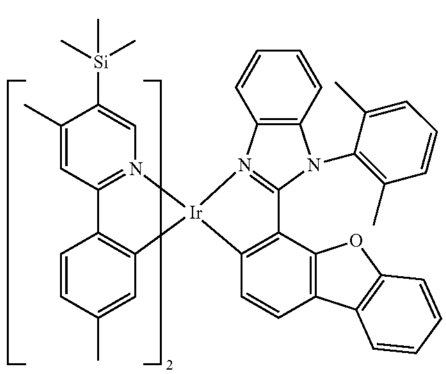
231
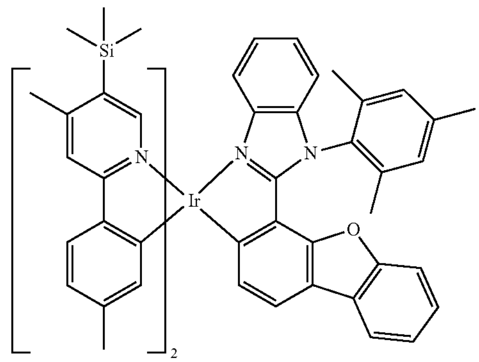
232
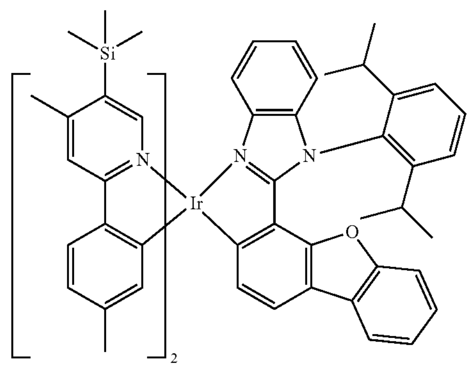
233
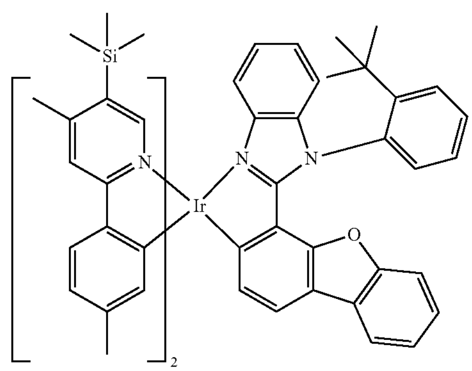
234
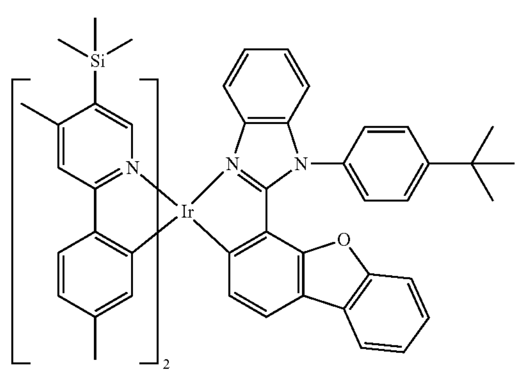

-continued
235
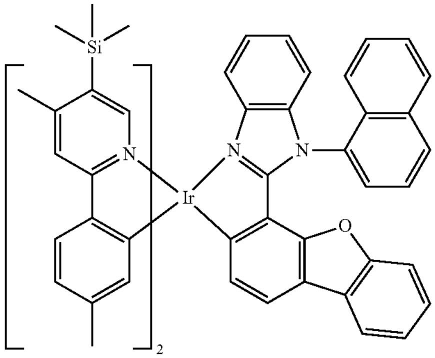
236
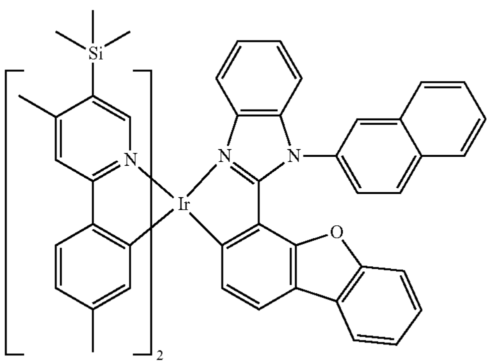
237
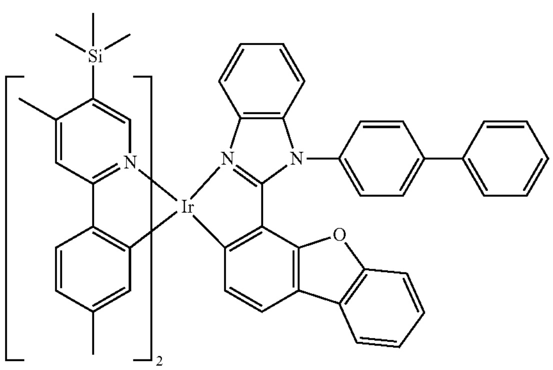
238
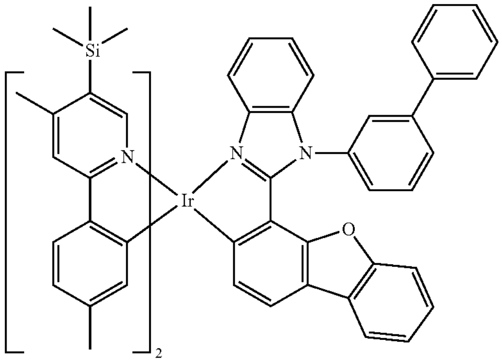
-continued
239
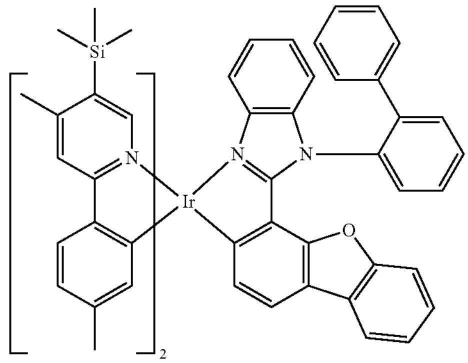
240
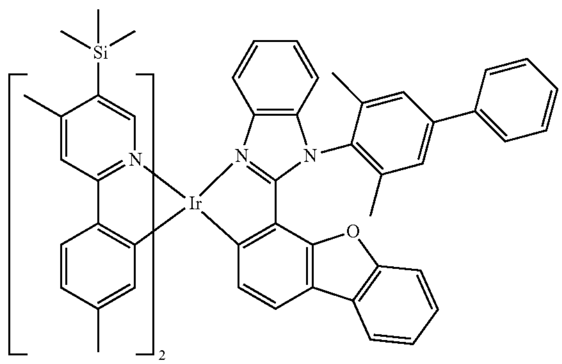
241
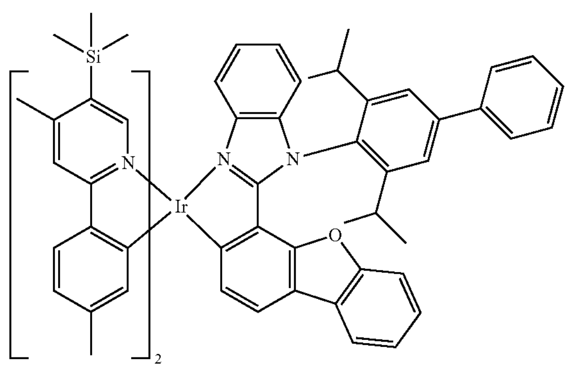
242
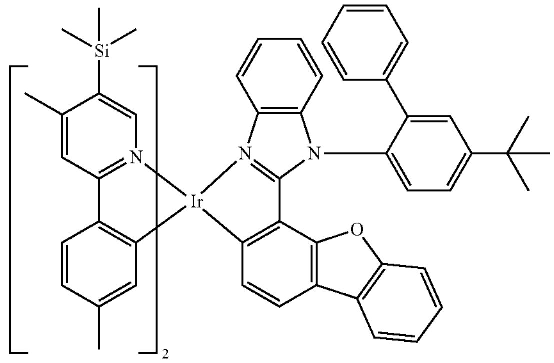

-continued
243
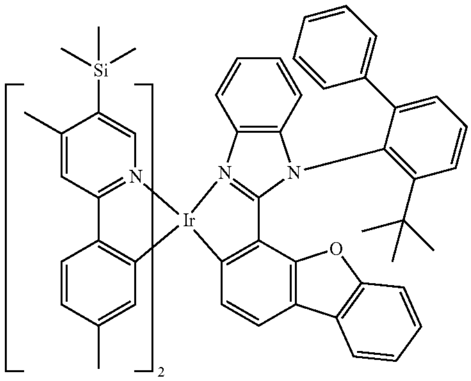
244
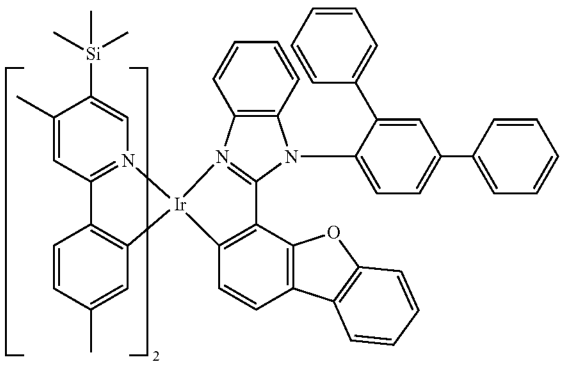
245
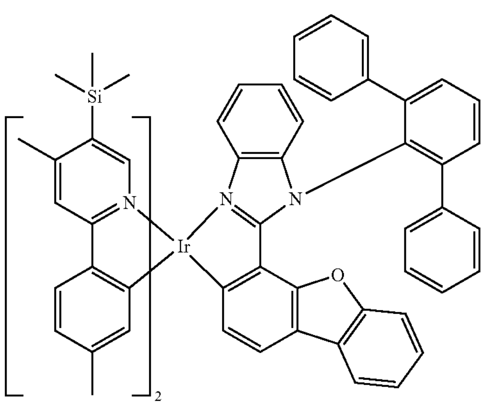
246
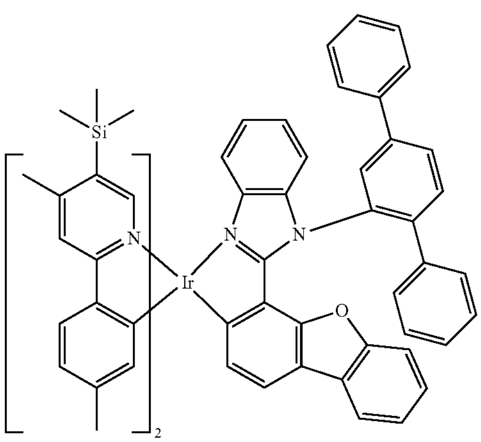
-continued
247
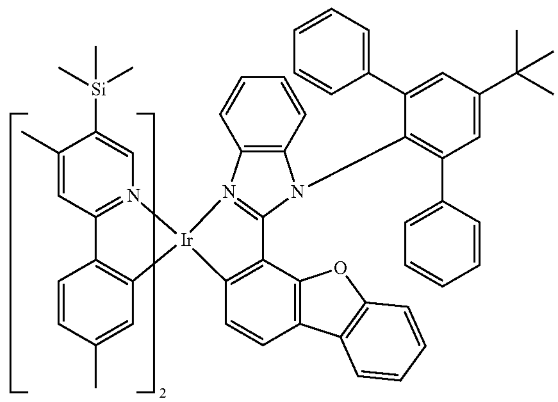
248
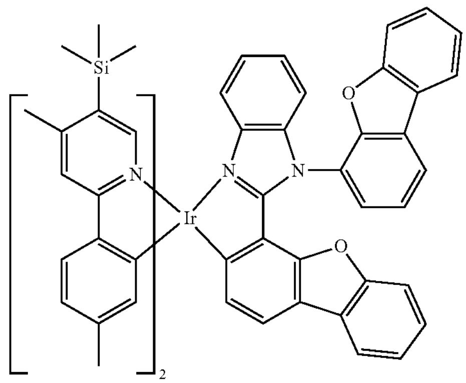
249
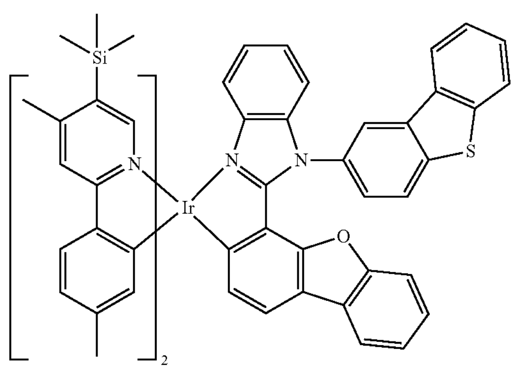
250
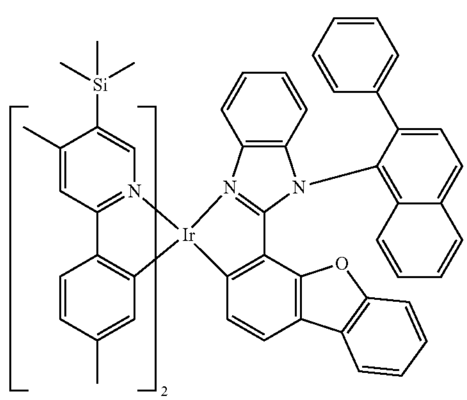

-continued
251
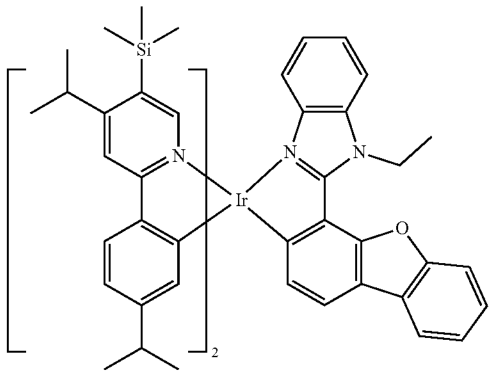
252
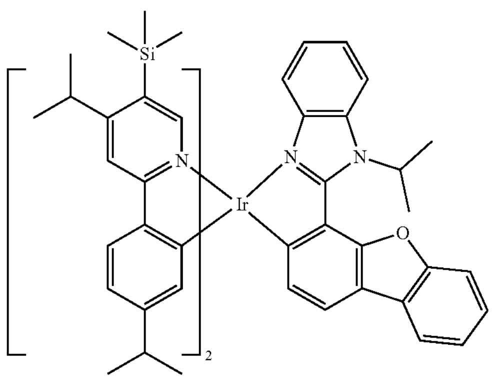
253
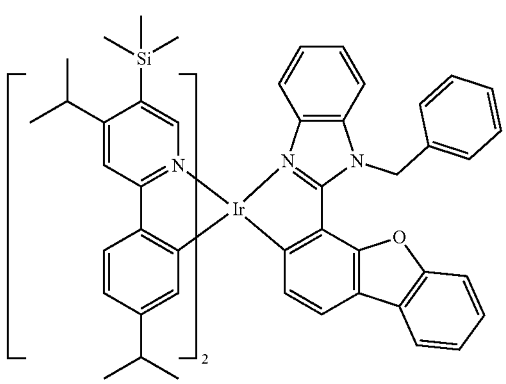
254
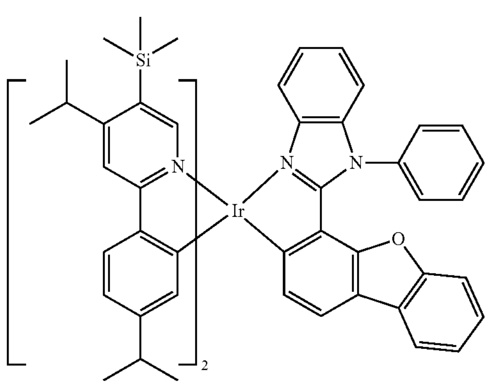
255
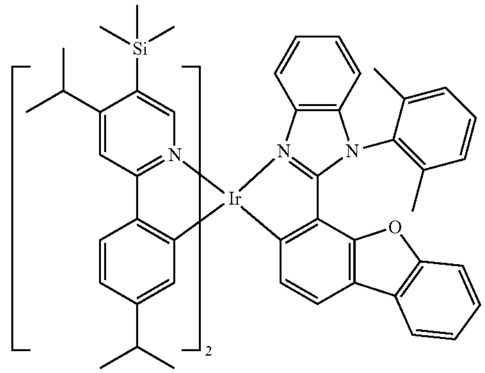
256
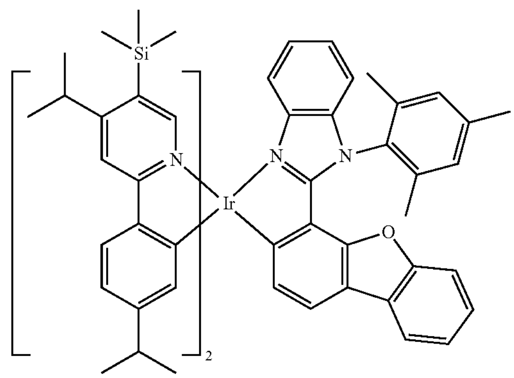
257
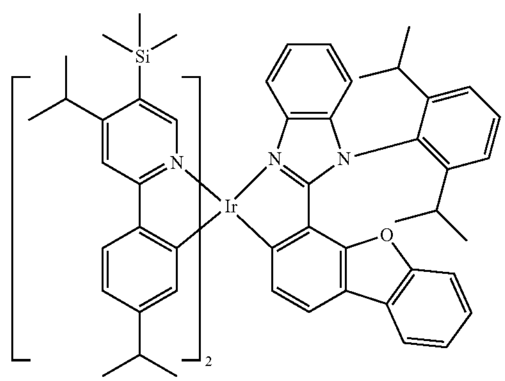
258
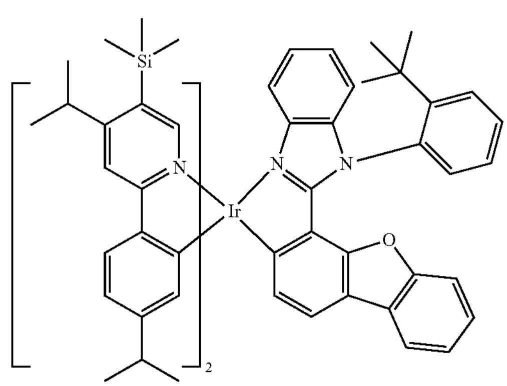

-continued
259
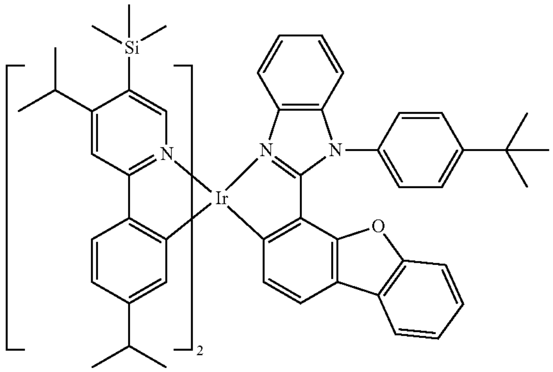
260
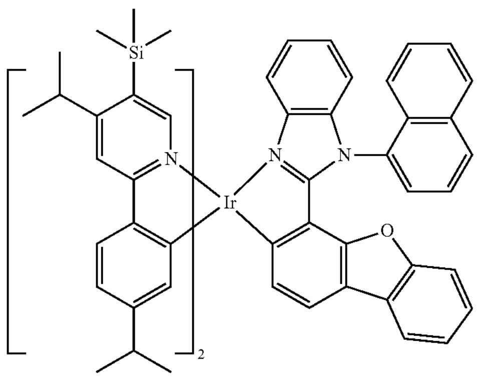
261
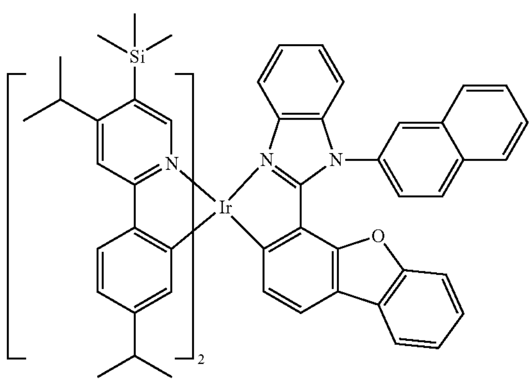
262
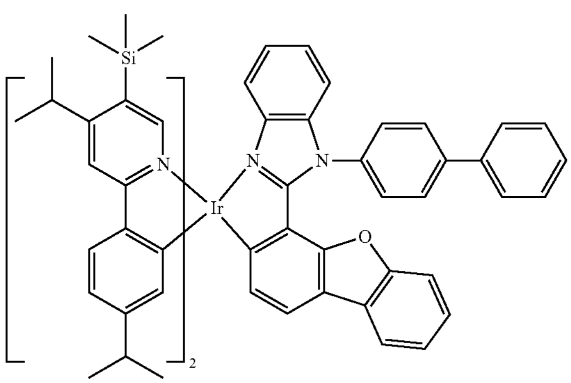
-continued
263
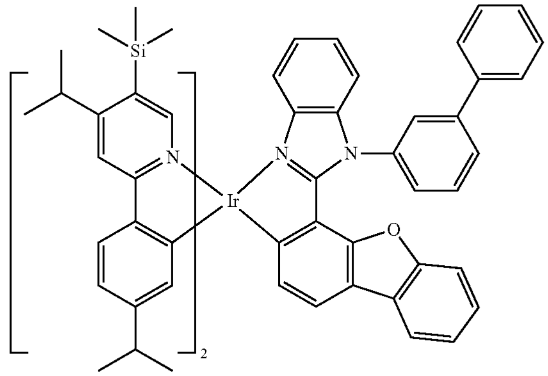
264
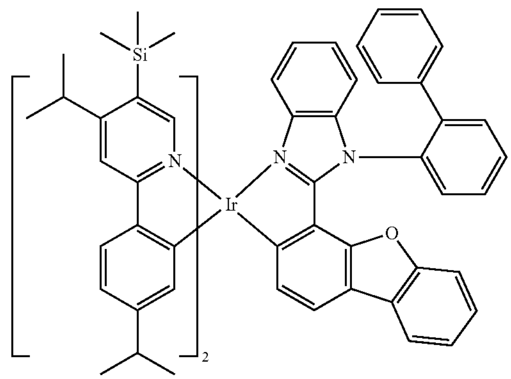
265
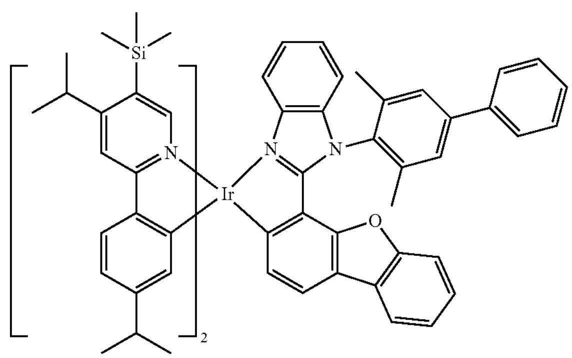
266
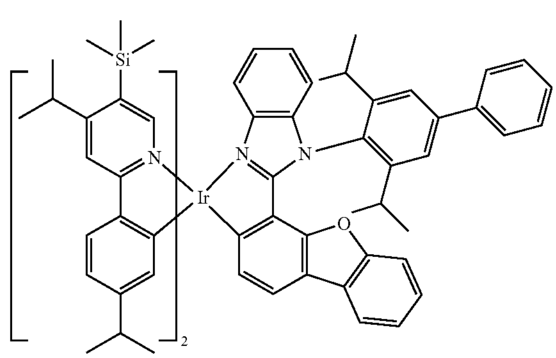

-continued
267
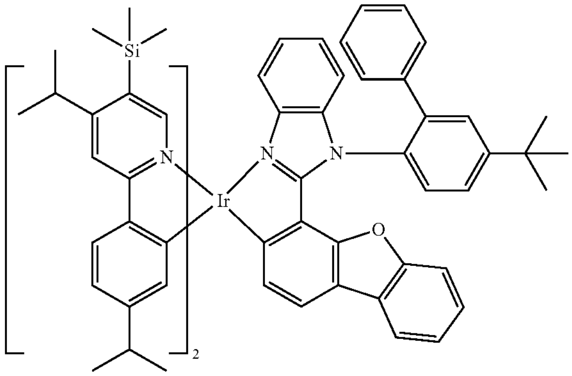
268
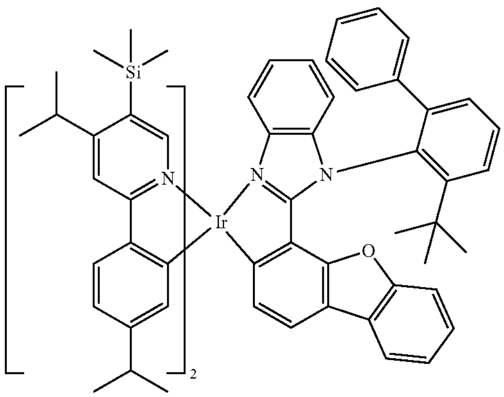
269
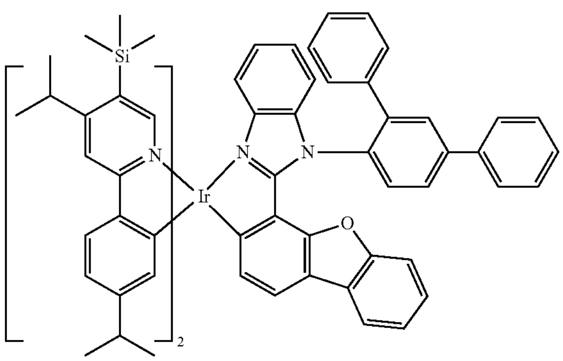
270
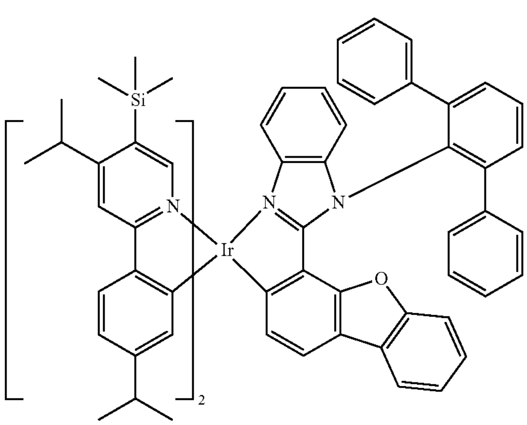
-continued
271
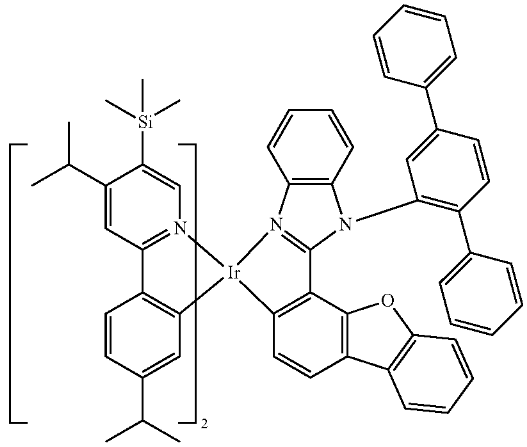
272
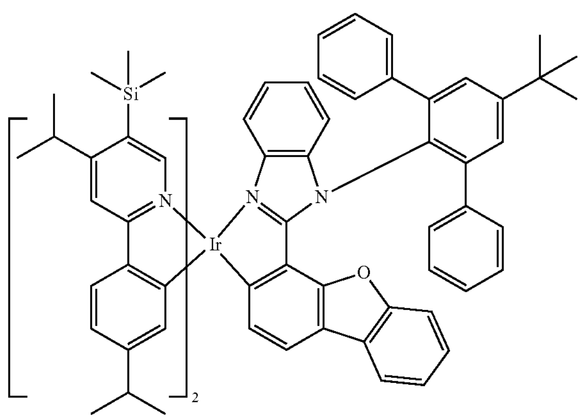
273
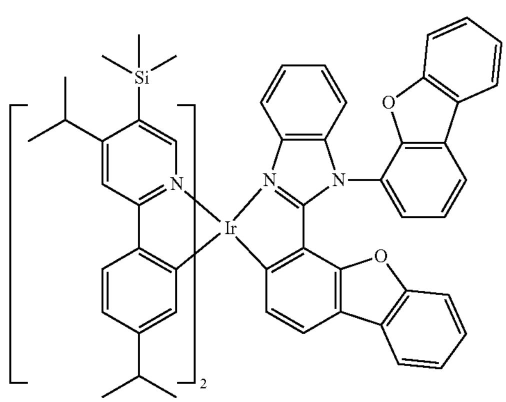

-continued
274
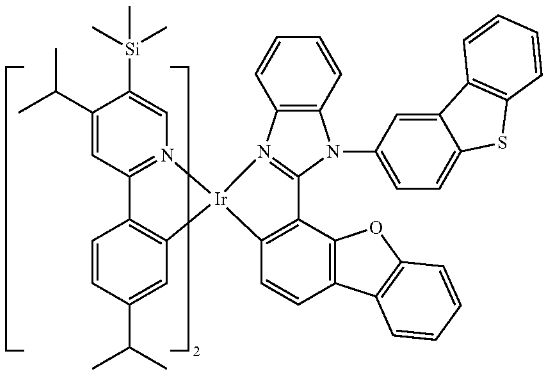
275
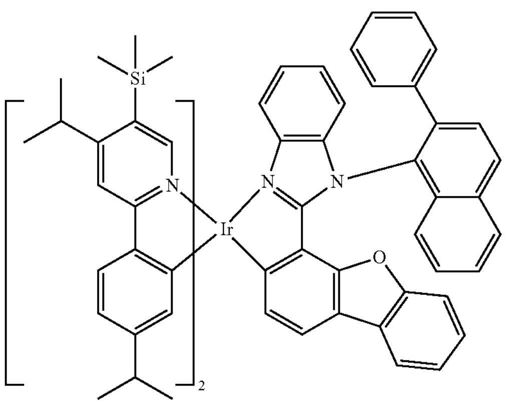
276
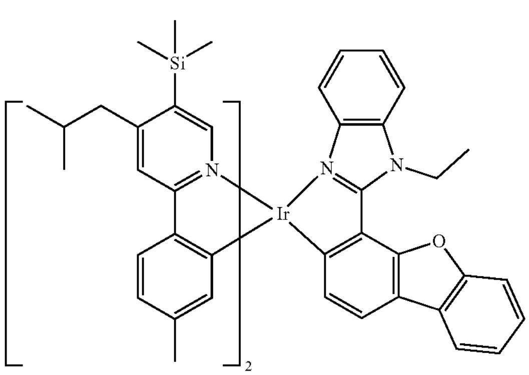
-continued
277
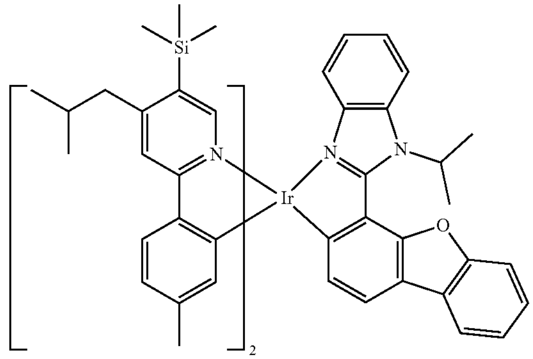
278
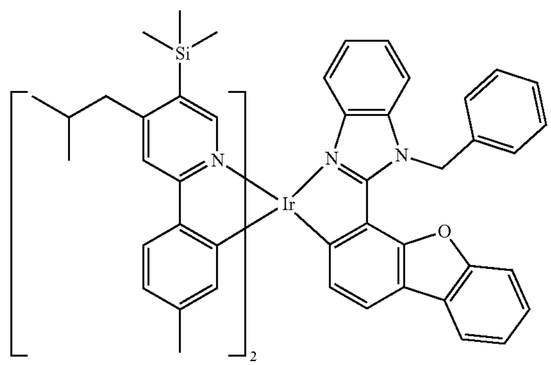
279
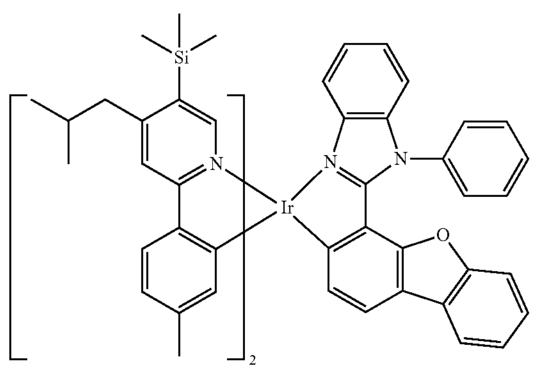
280
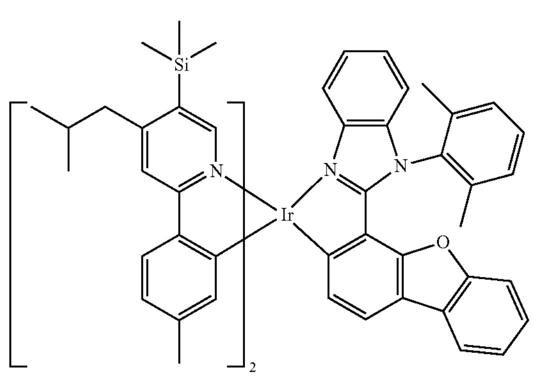

-continued
281
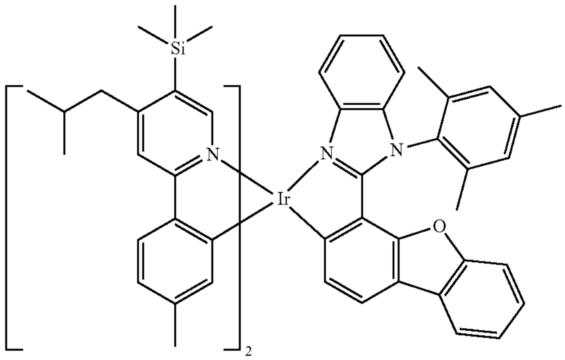
282
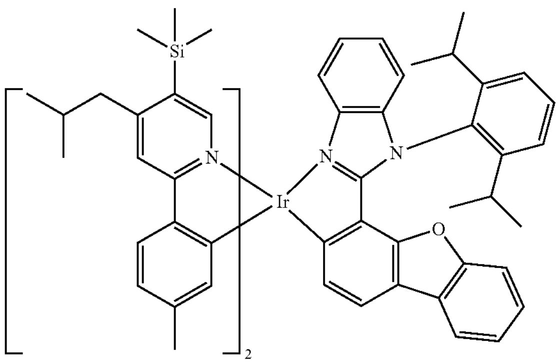
283
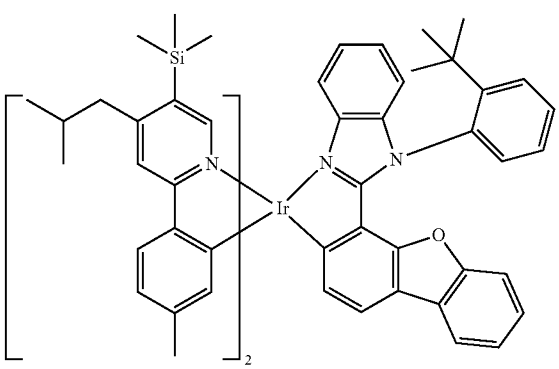
284
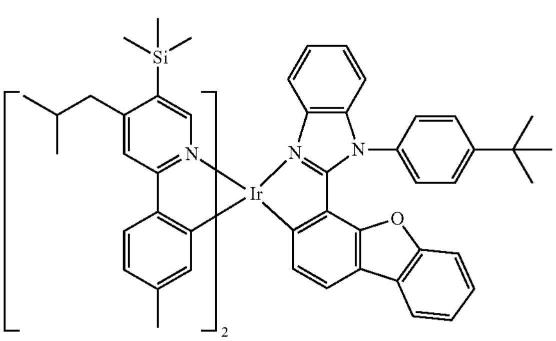
-continued
285
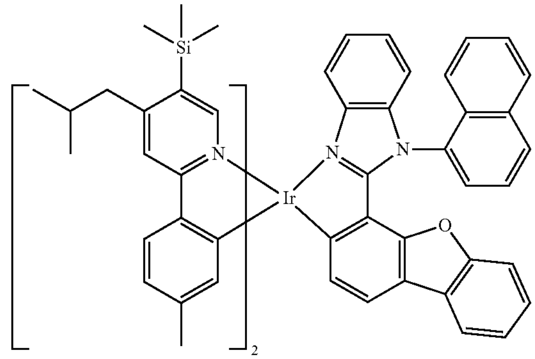
286
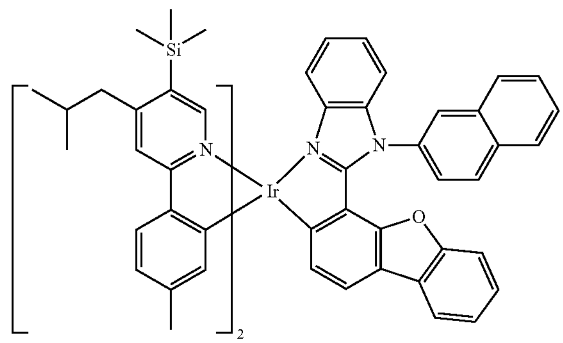
287
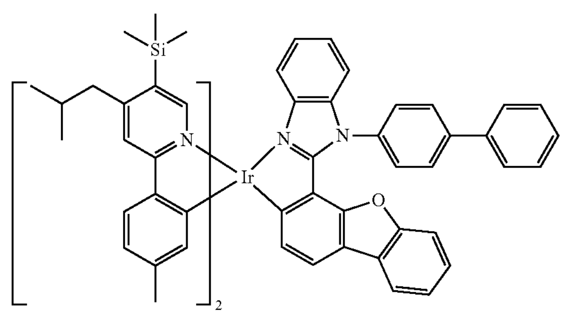
288
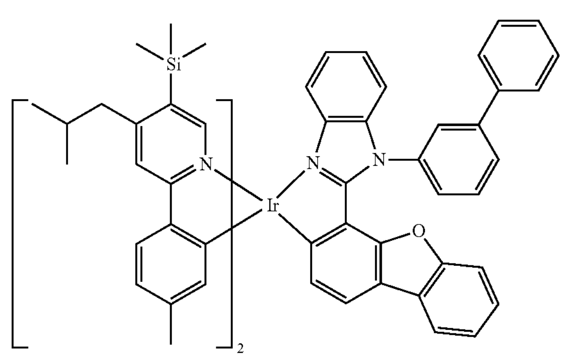

-continued
289
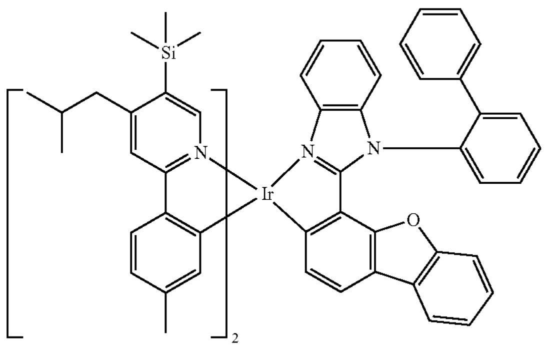
290
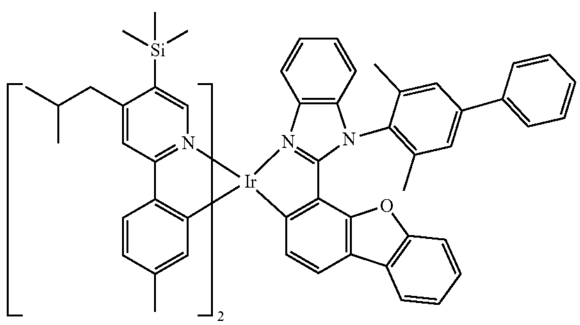
291
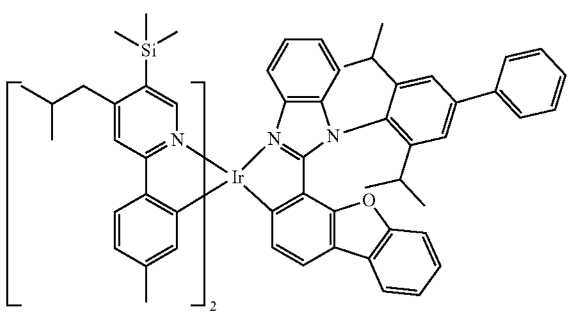
292
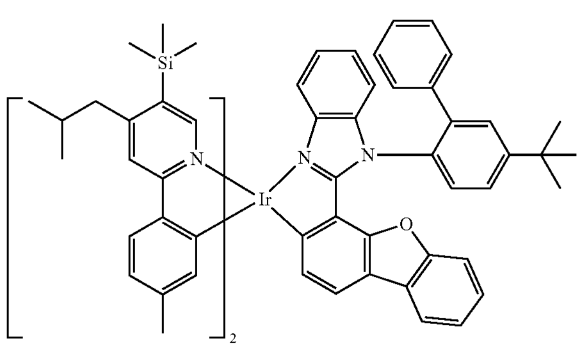
-continued
293
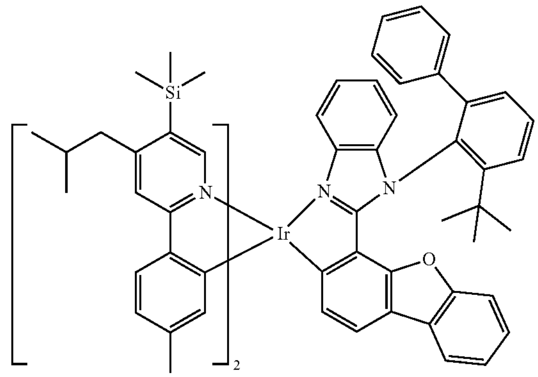
294
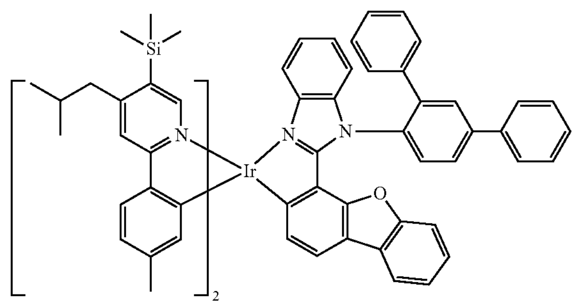
295
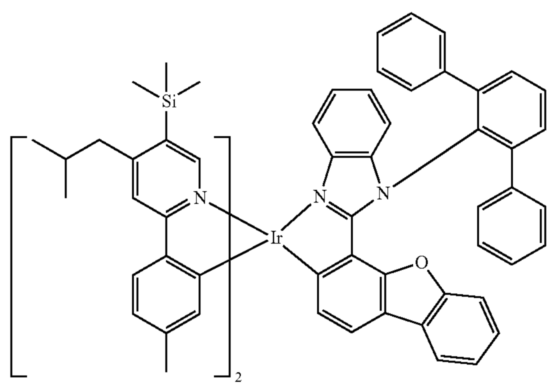
296
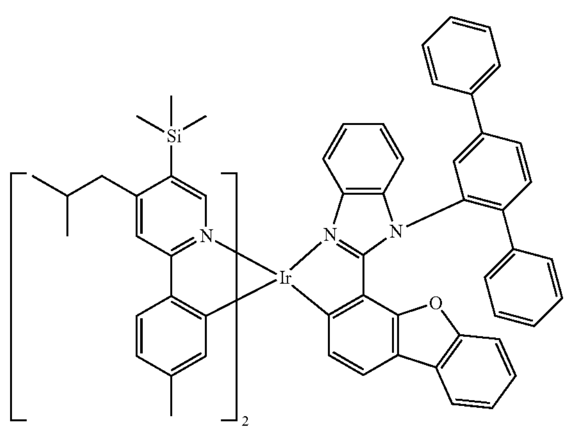

-continued
297
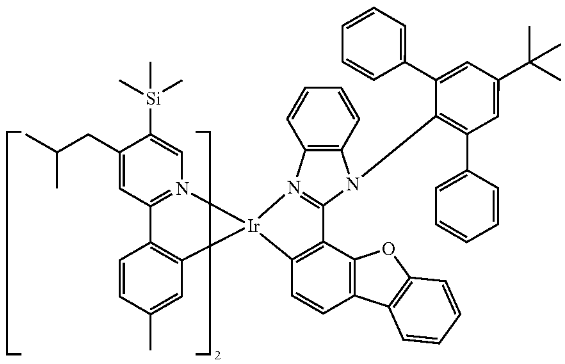
298
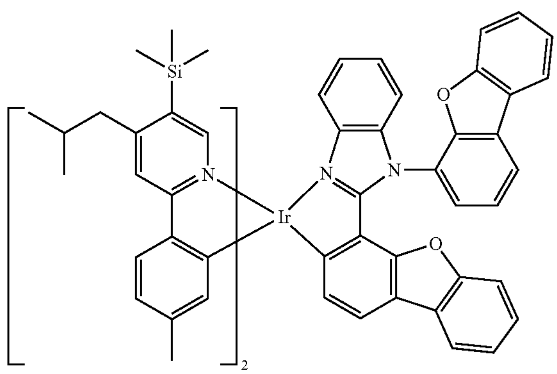
299
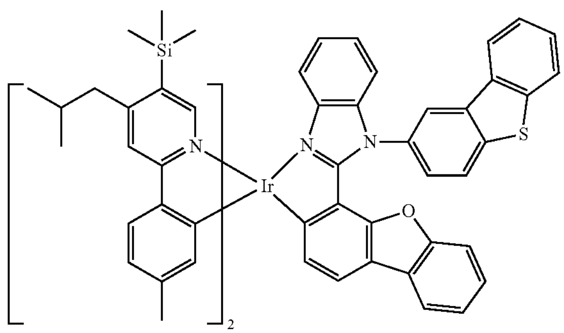
300
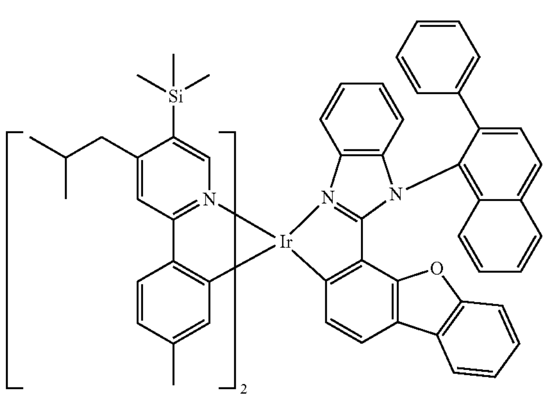
-continued
301
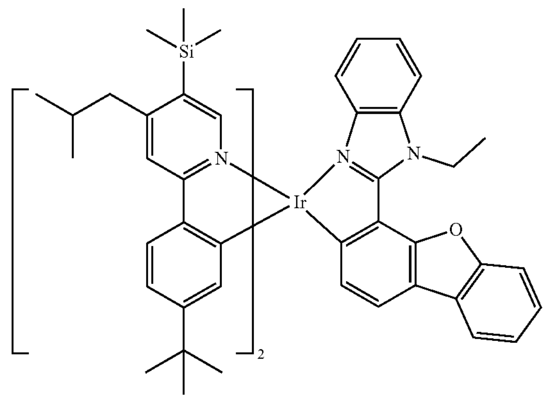
302
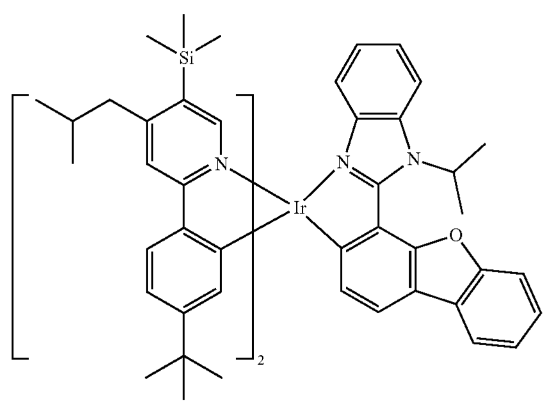
303
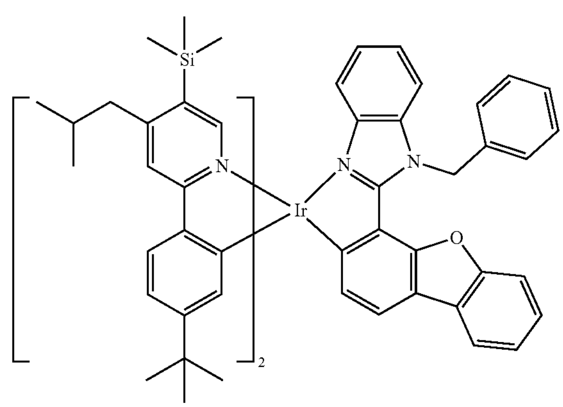

-continued
304
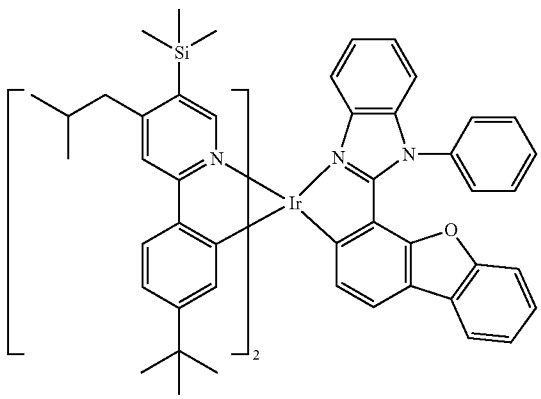
305
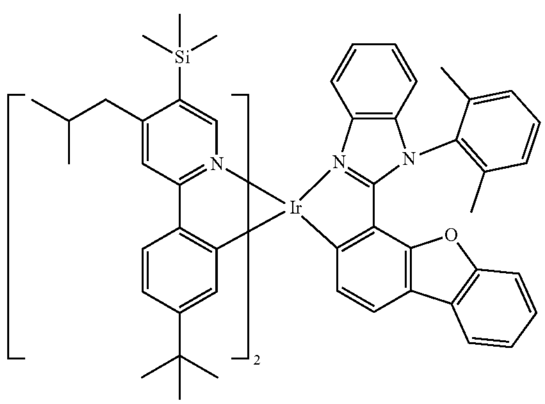
306
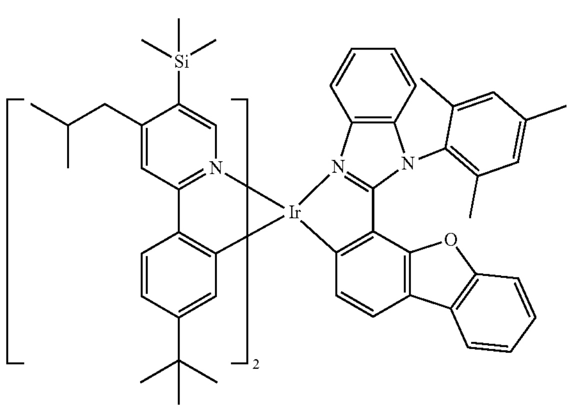
-continued
307
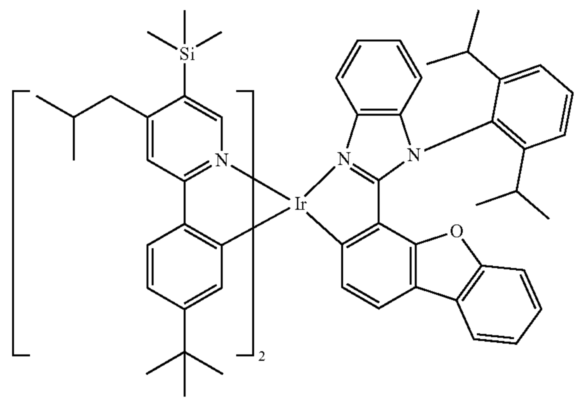
308
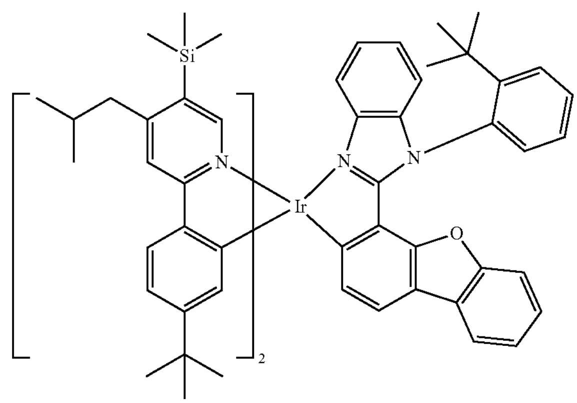
309
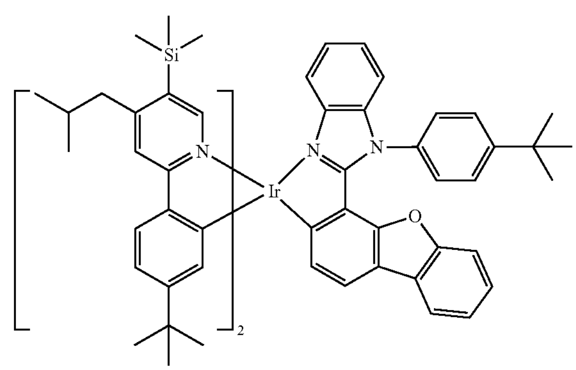
310
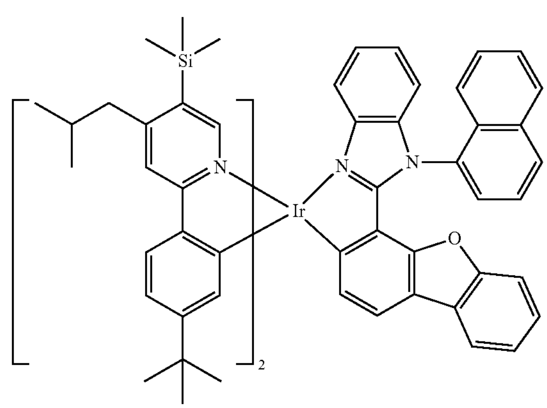

-continued
311
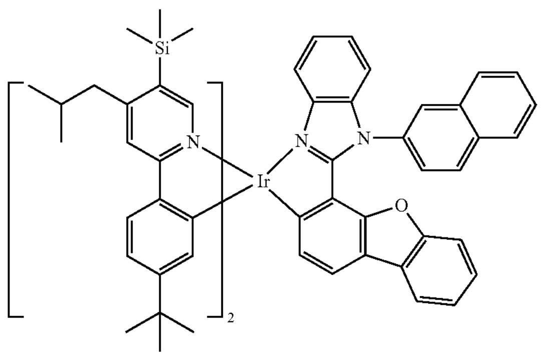
312
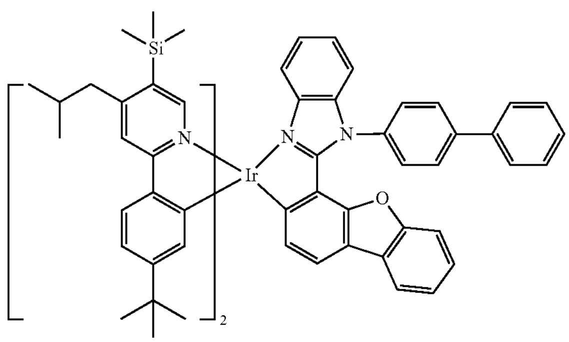
313
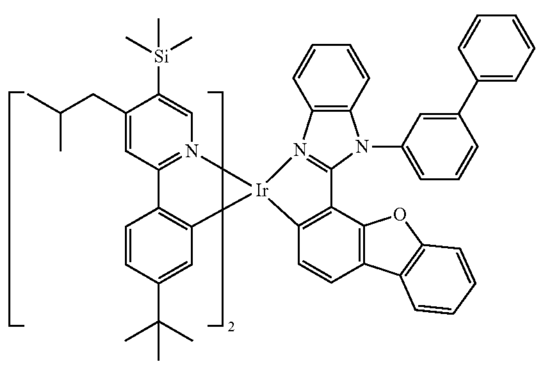
314
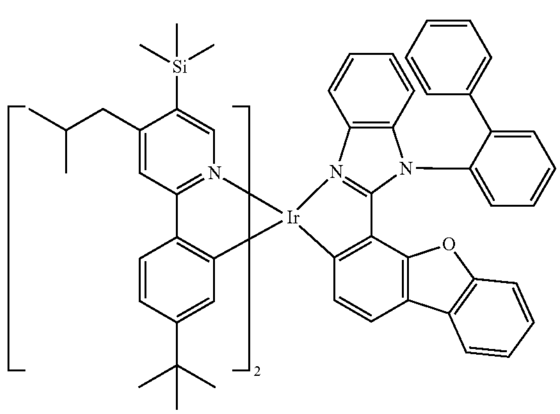
-continued
315
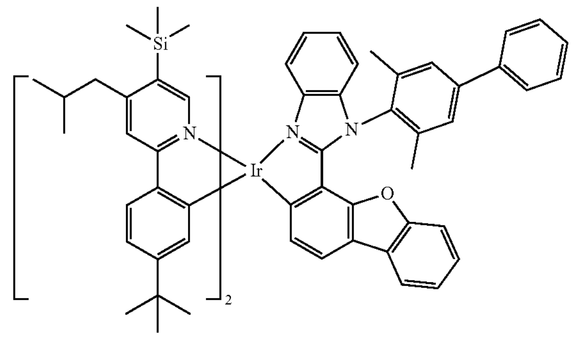
316
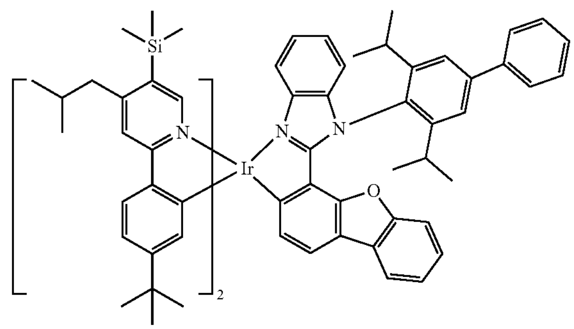
317
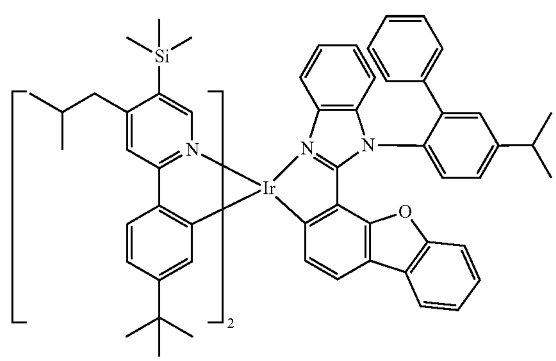
318
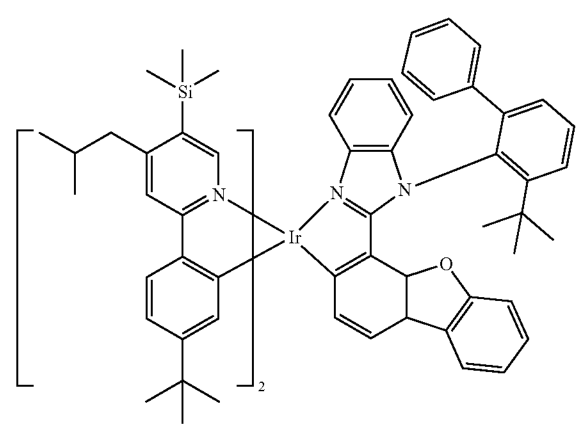

-continued
319
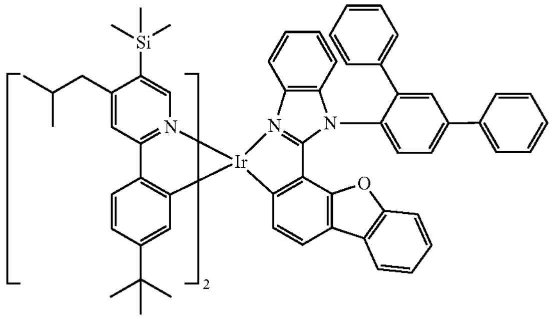
320
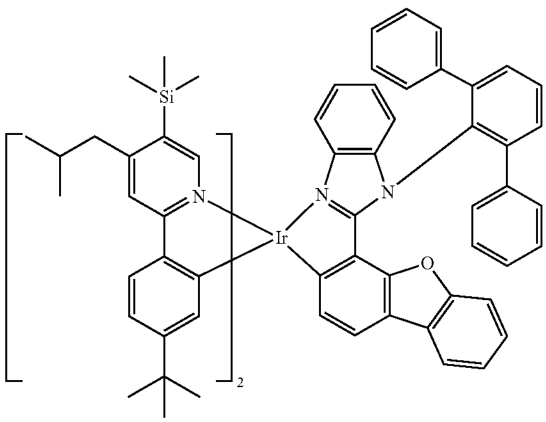
321
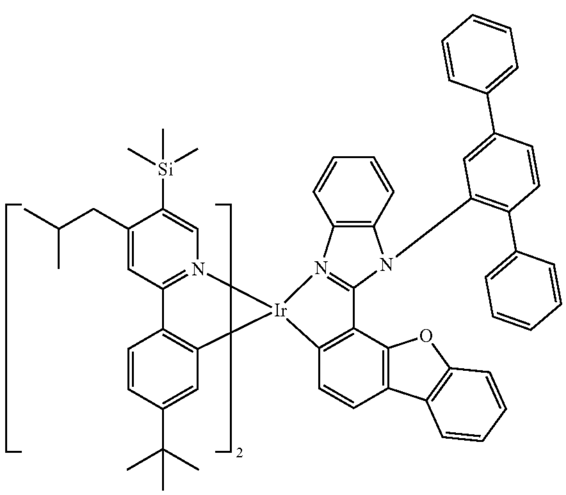
-continued
322
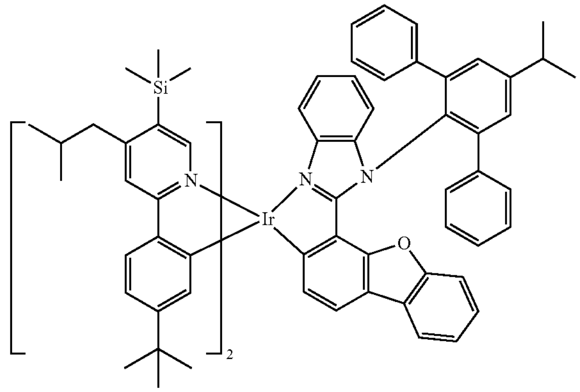
323
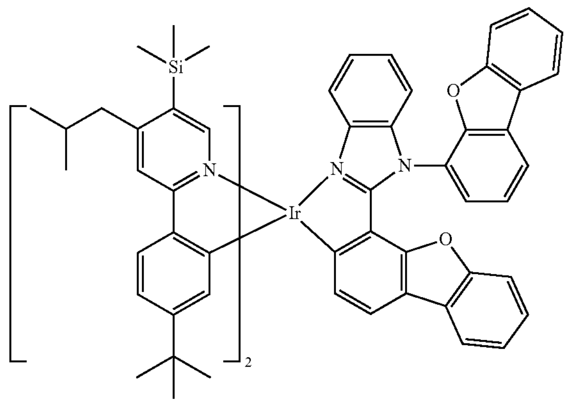
324
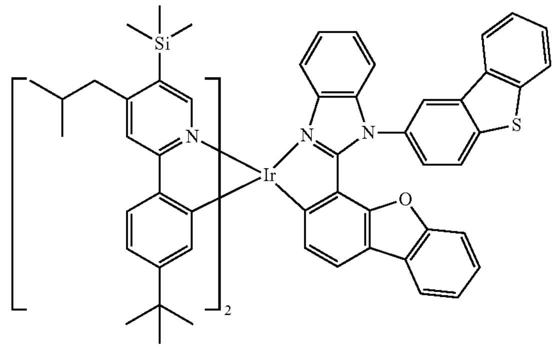
325
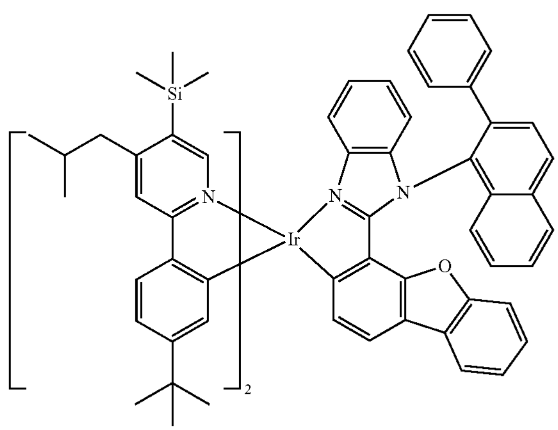

-continued
326
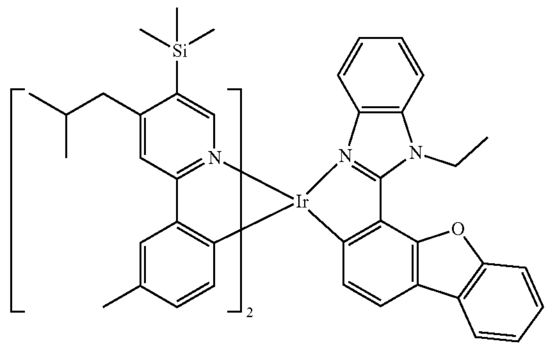
327
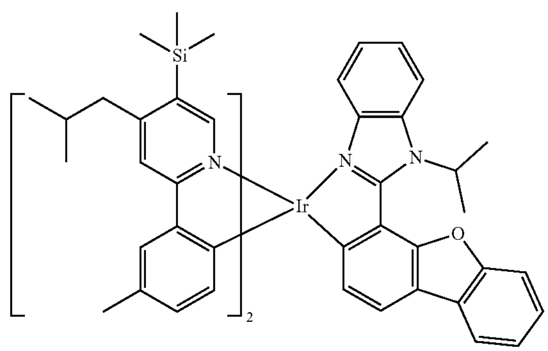
328
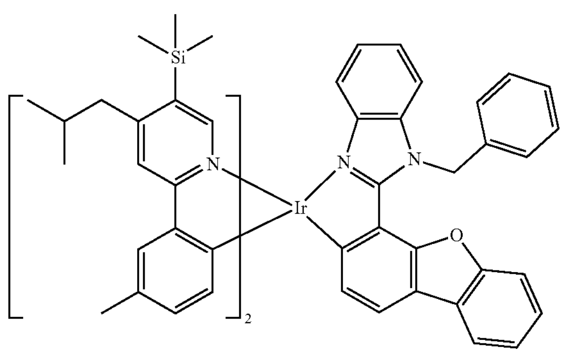
329
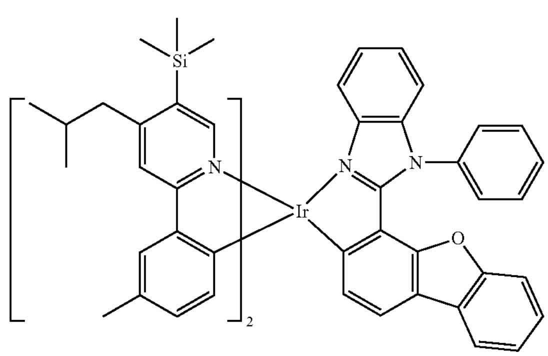
-continued
330
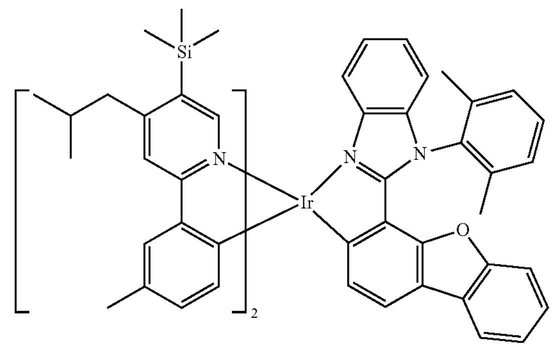
331
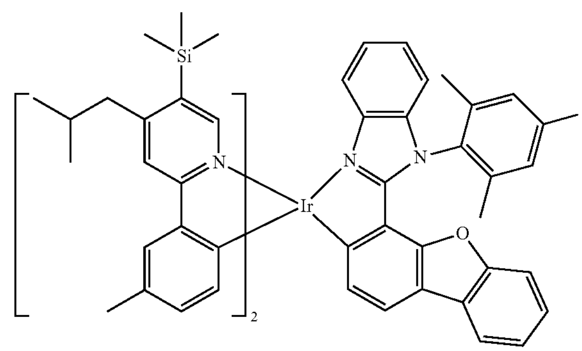
332
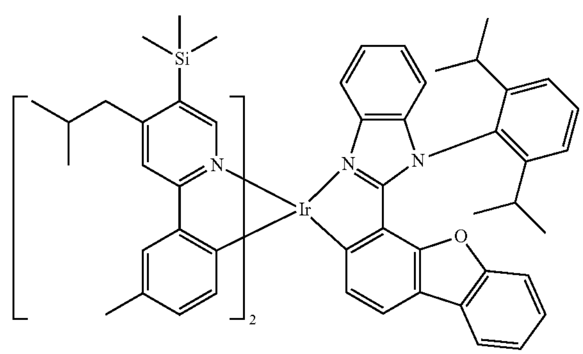
333
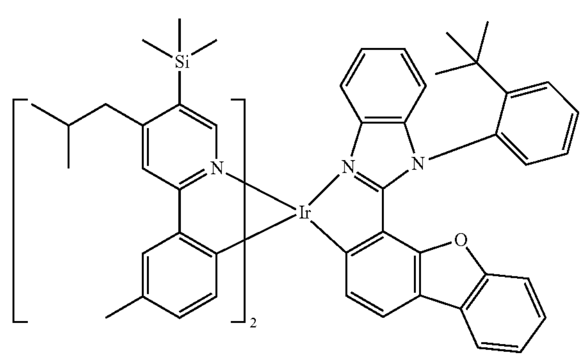

-continued
334
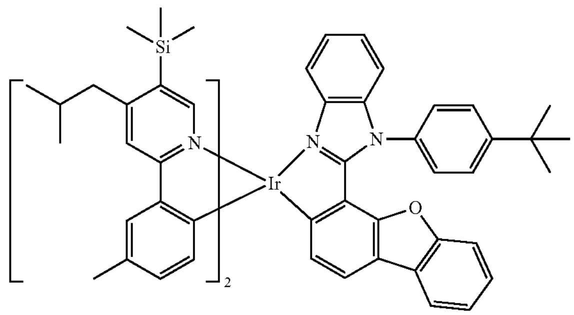
335
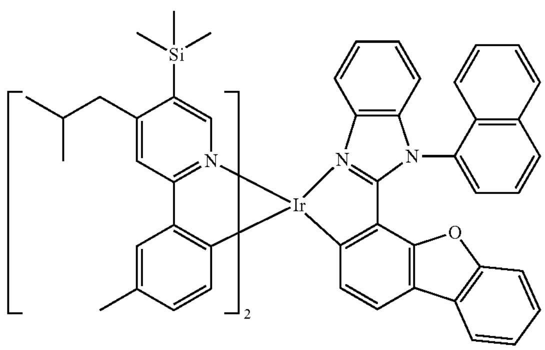
336
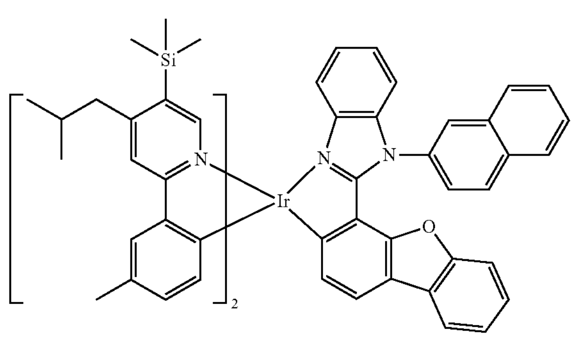
337
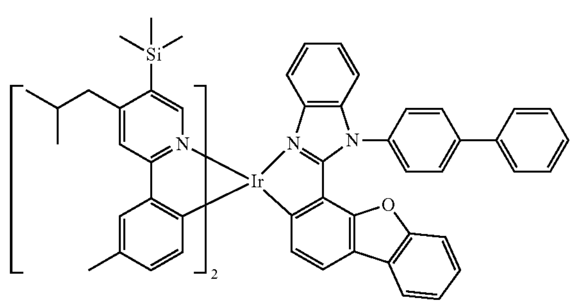
-continued
338
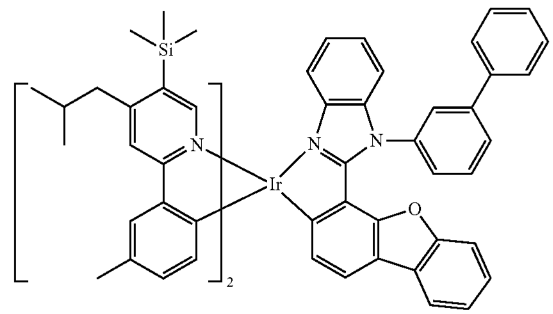
339
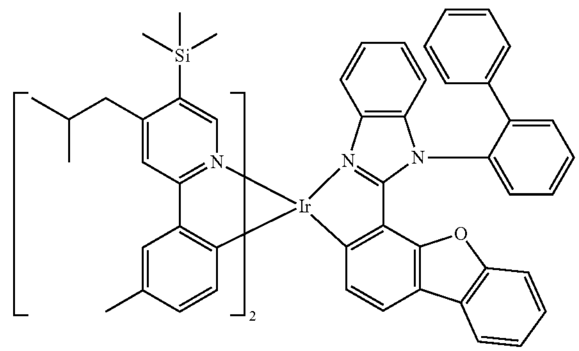
340
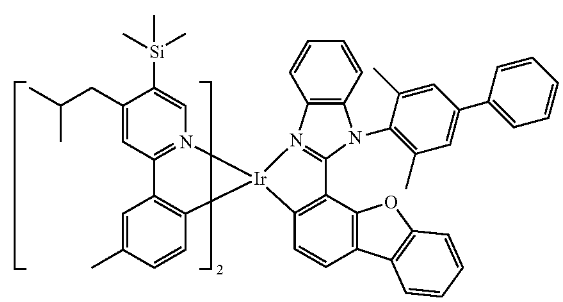
341
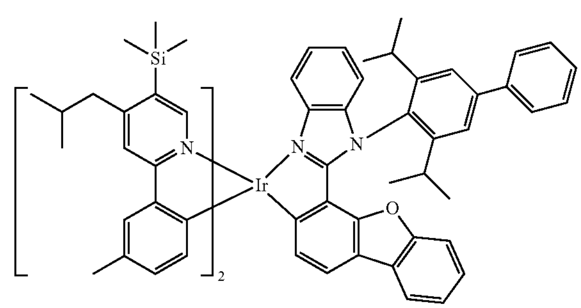

-continued
342
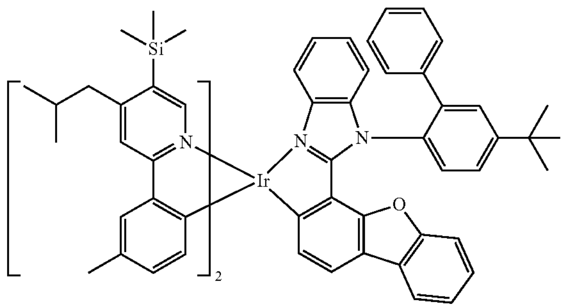
343
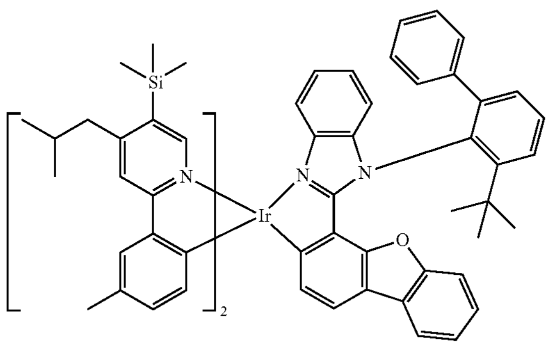
343
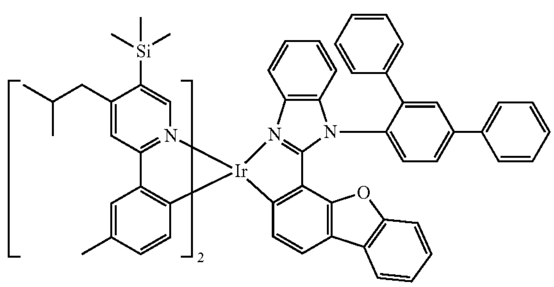
345
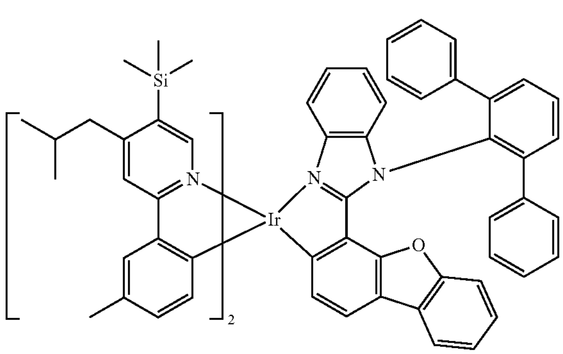
-continued
346
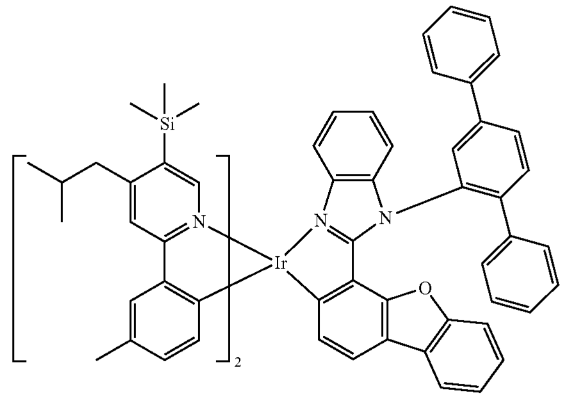
347
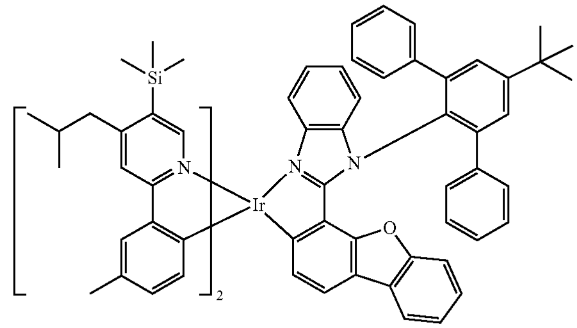
348
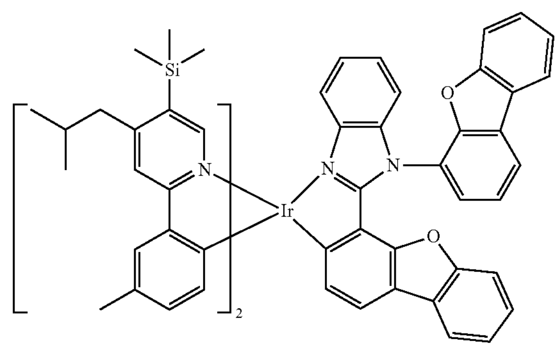
349
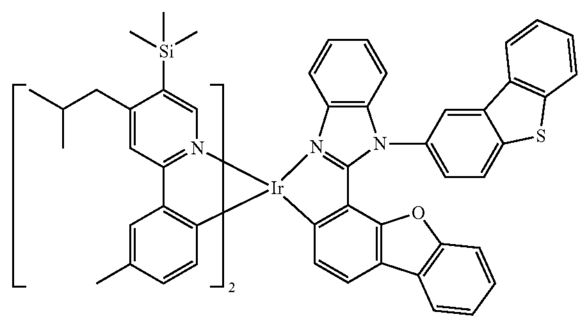

-continued
350
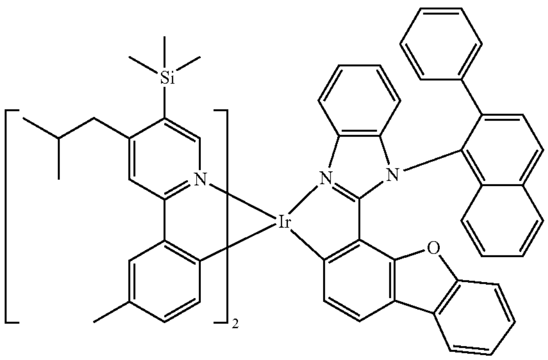
351
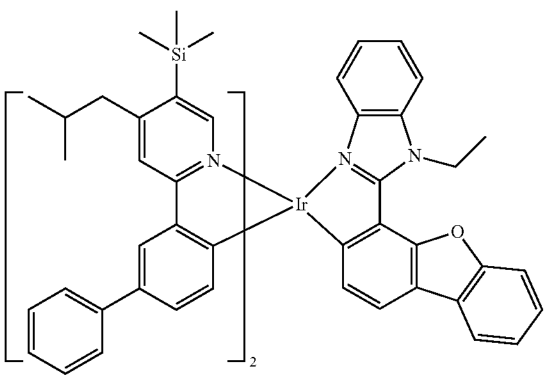
352
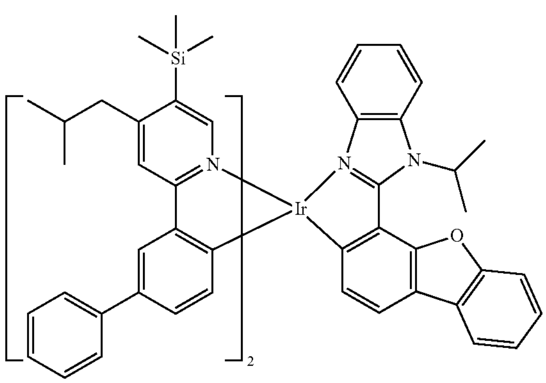
353
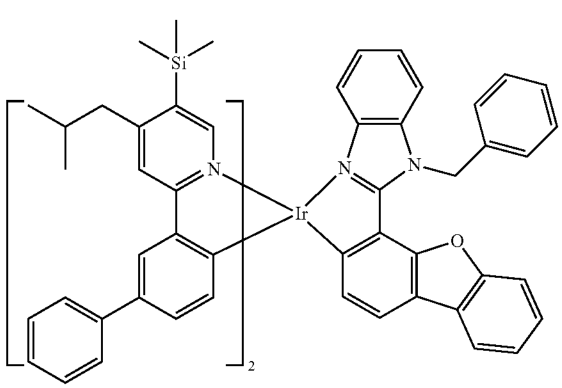
-continued
354
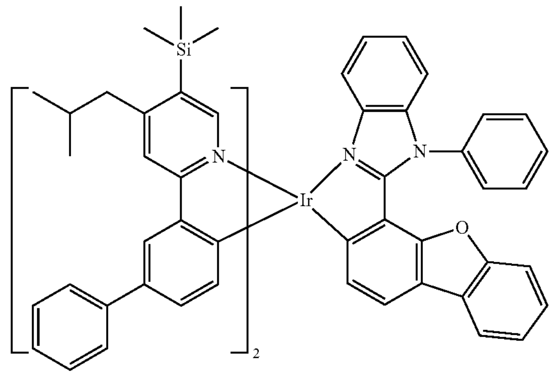
355
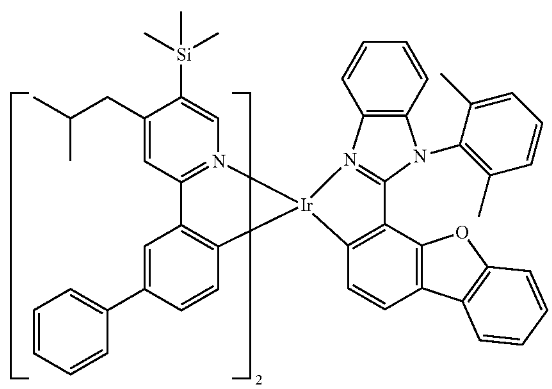
356
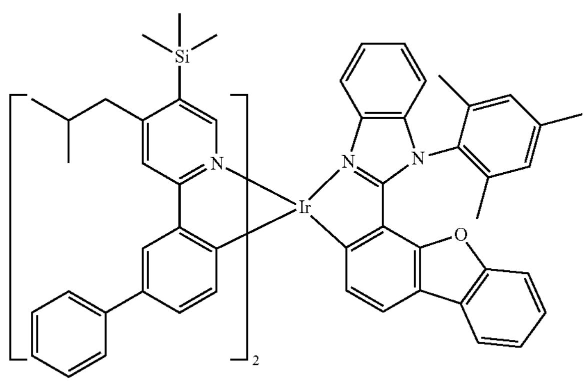
357
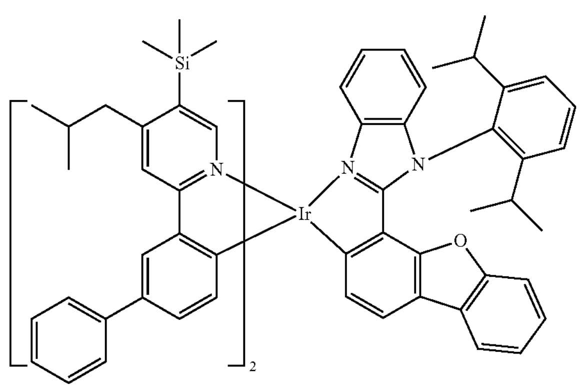

-continued
358
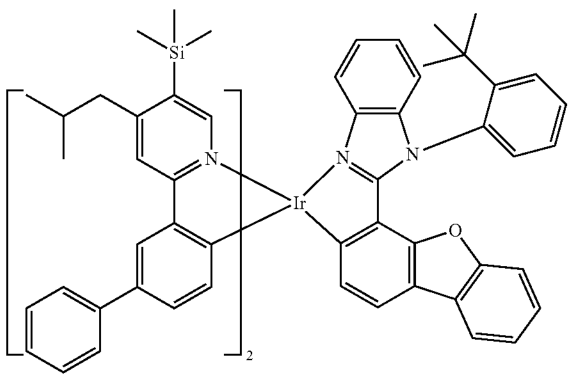
359
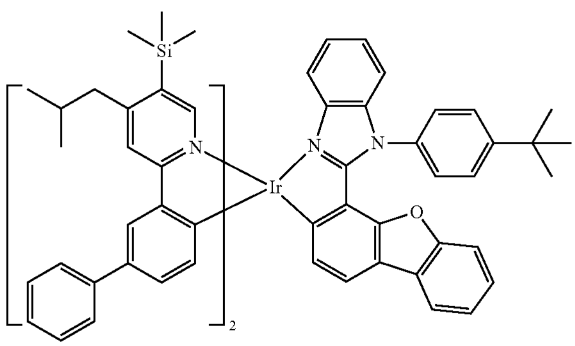
360
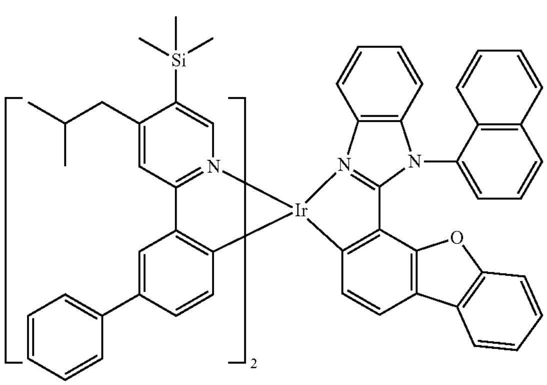
361
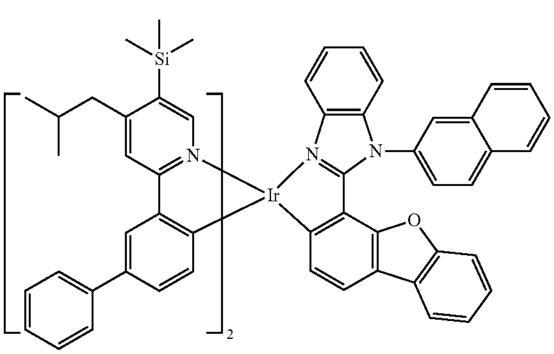
-continued
362
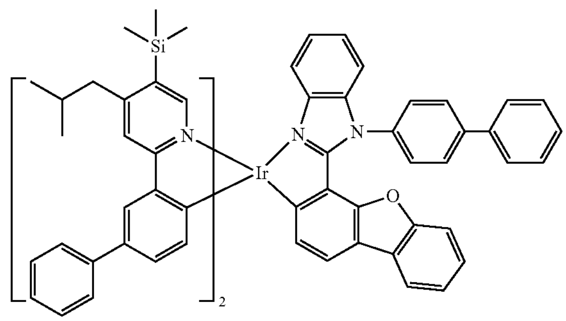
363
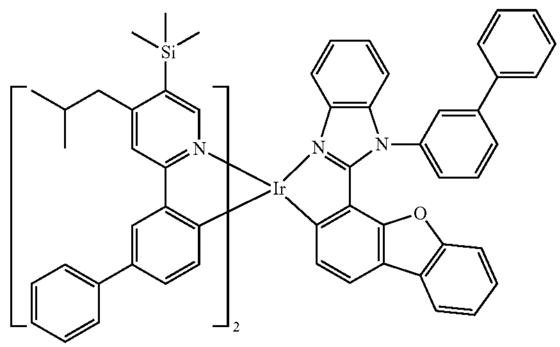
364
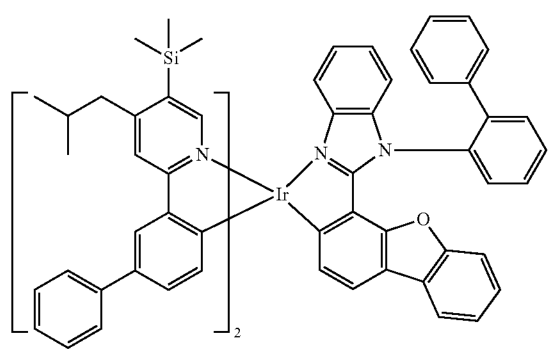
365
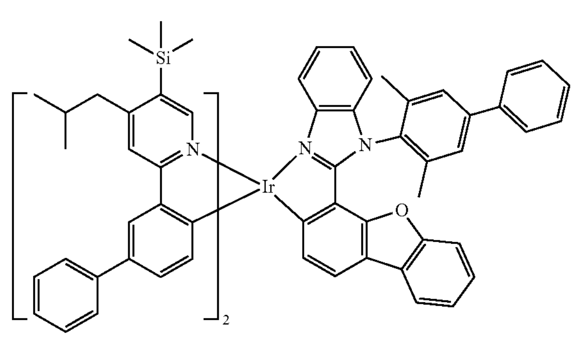

-continued
366
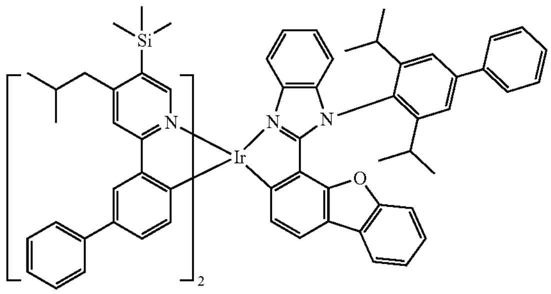
367
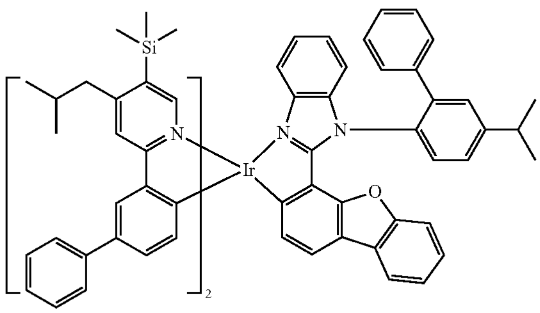
368
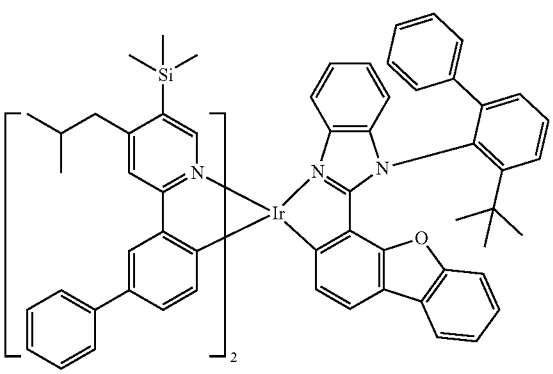
369
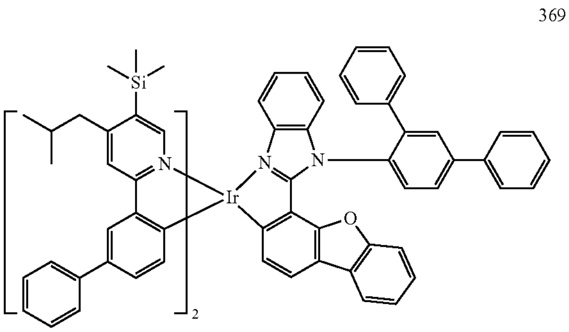
-continued
370
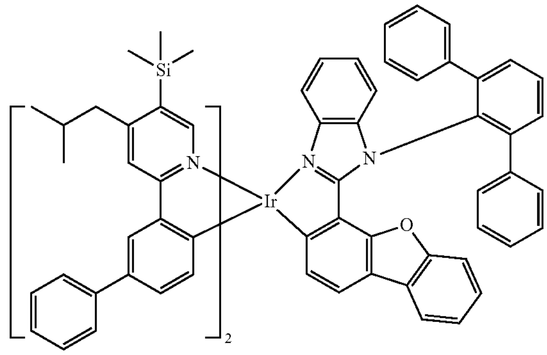
371
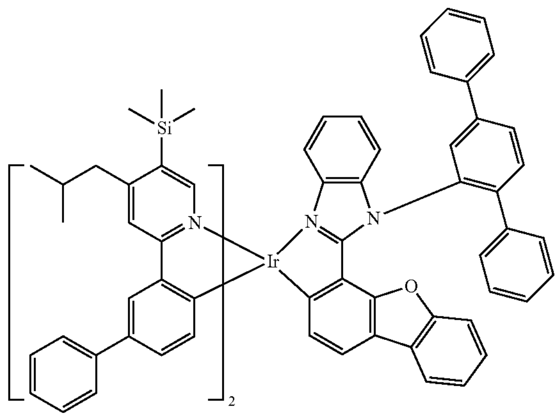
372
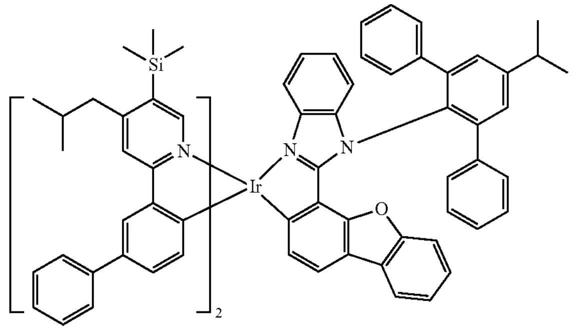
373
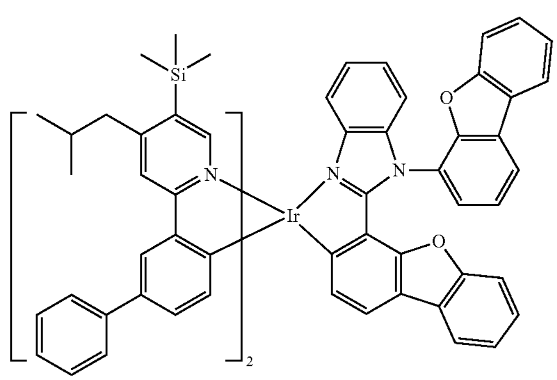

-continued
374
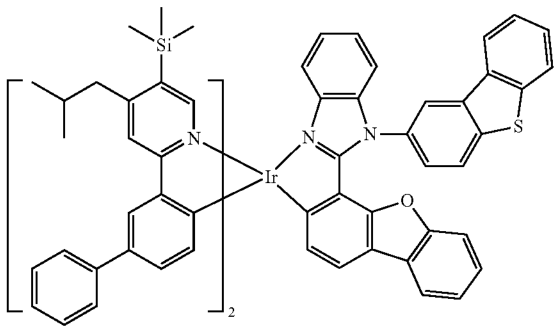
375
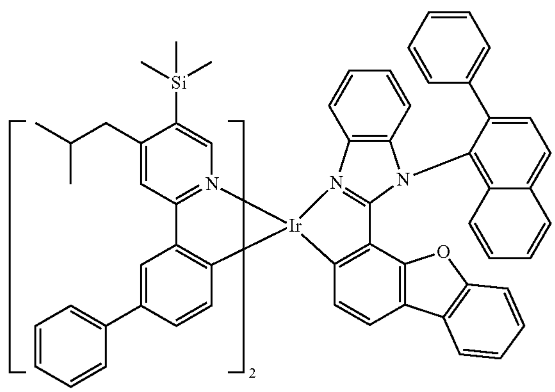
376
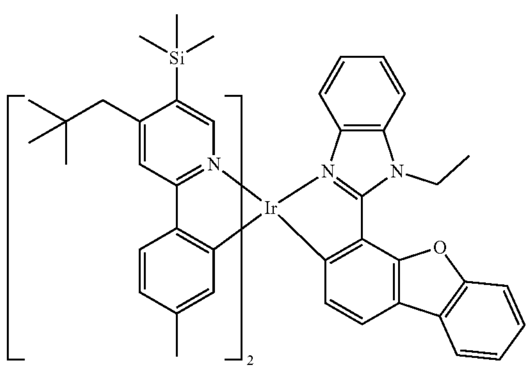
377
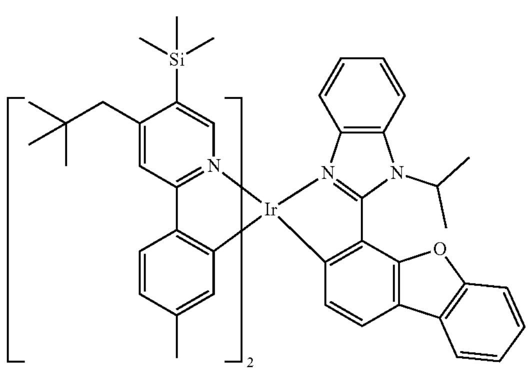
-continued
378
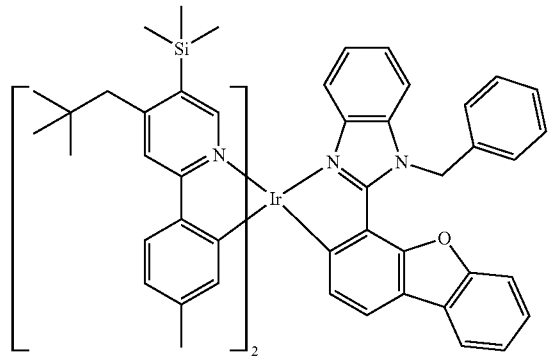
379
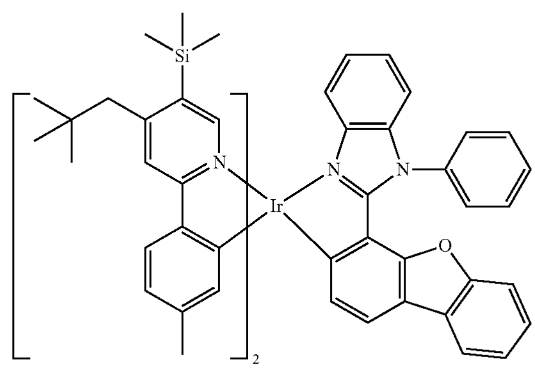
380
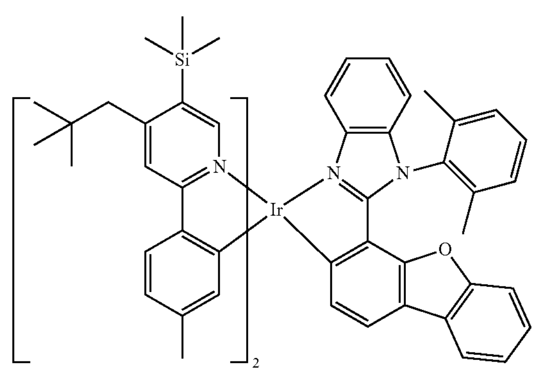
381
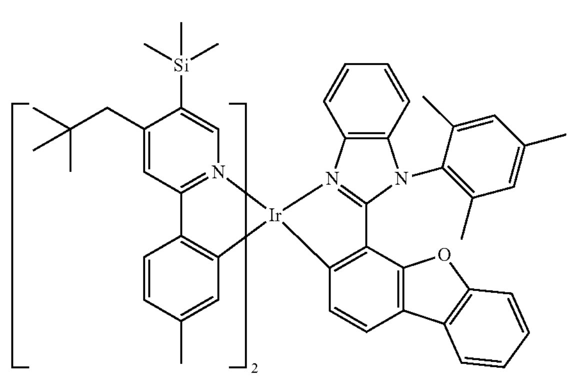

-continued
382
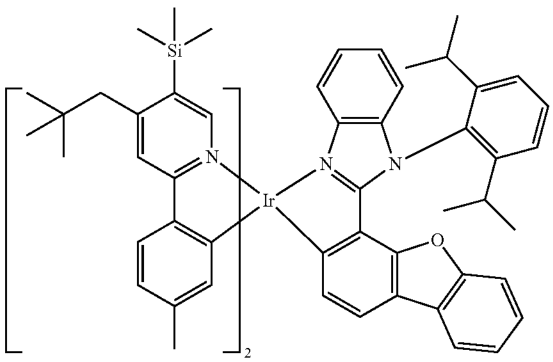
383
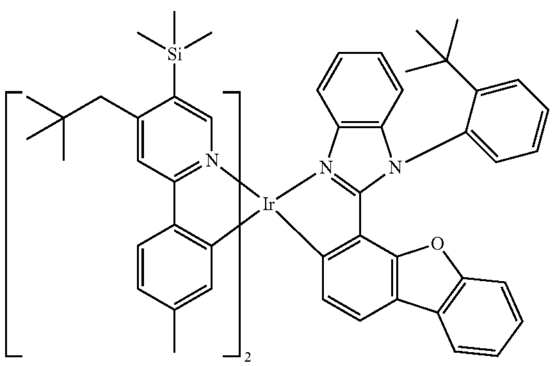
384
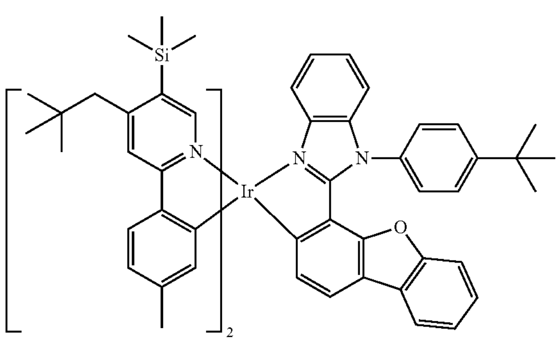
385
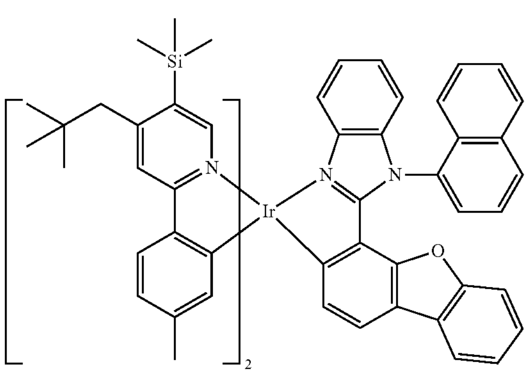
-continued
386
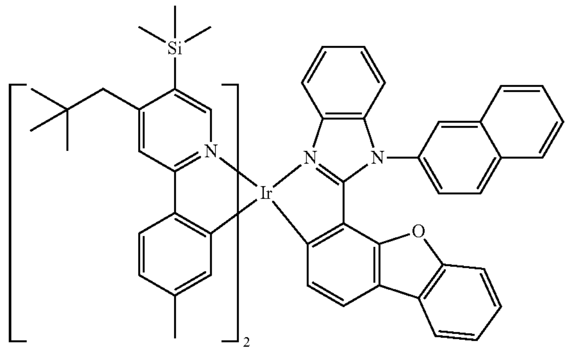
387
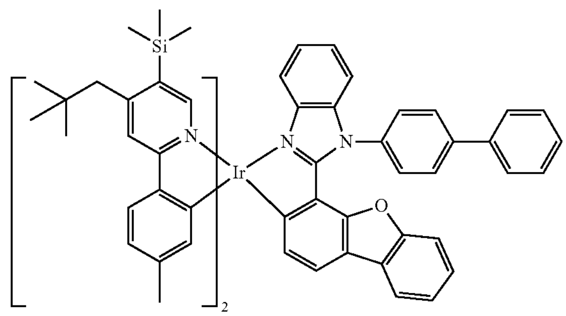
388
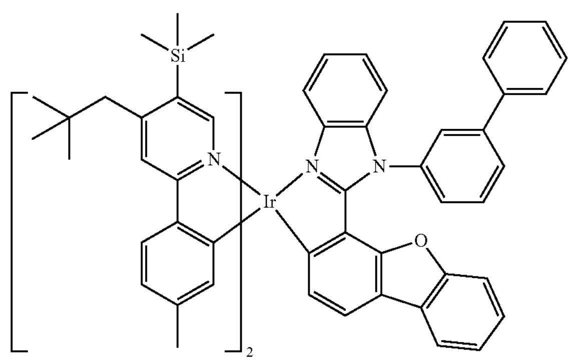
389
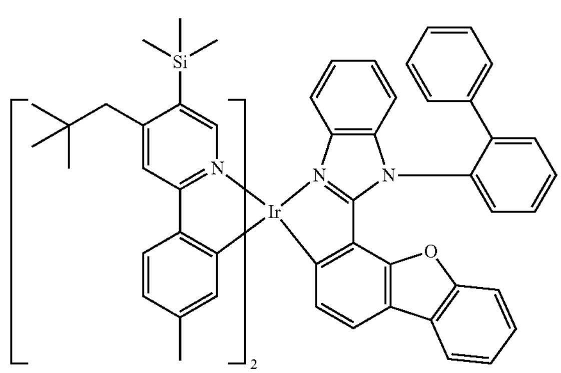

-continued
390
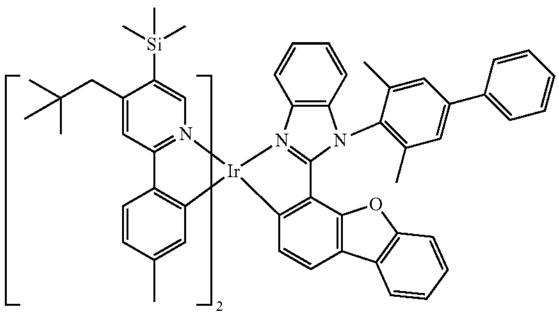
391
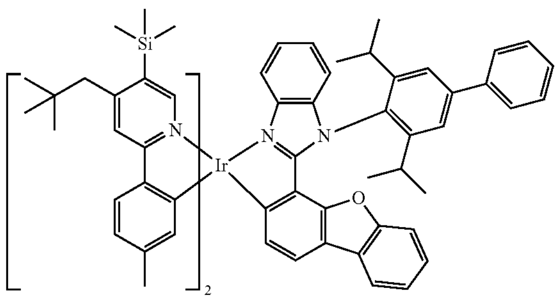
392
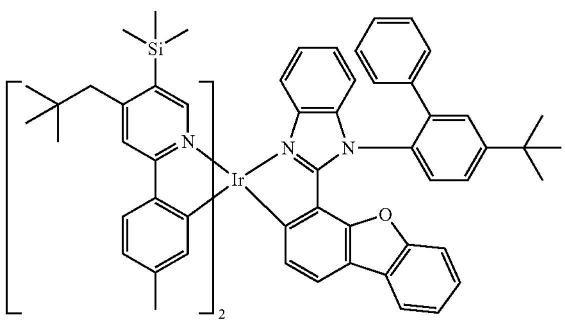
393
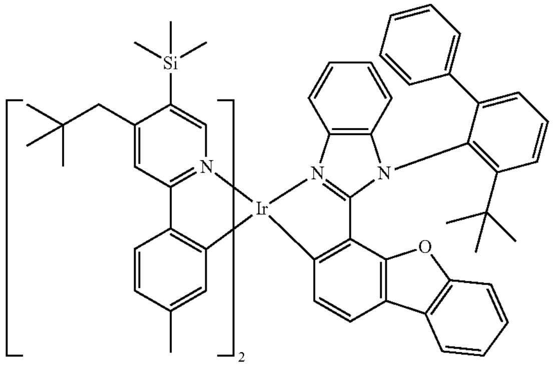
-continued
394
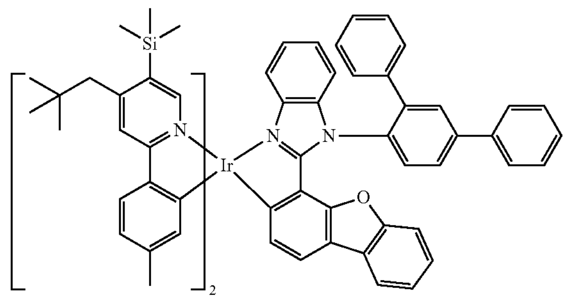
395
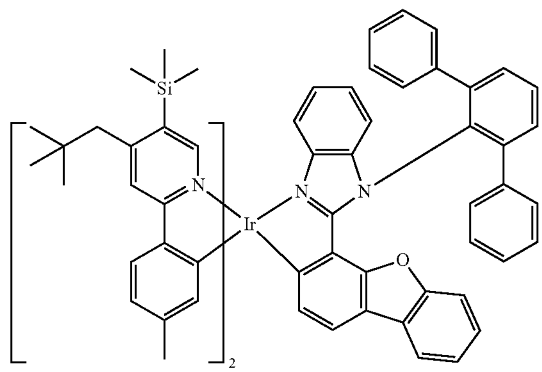
396
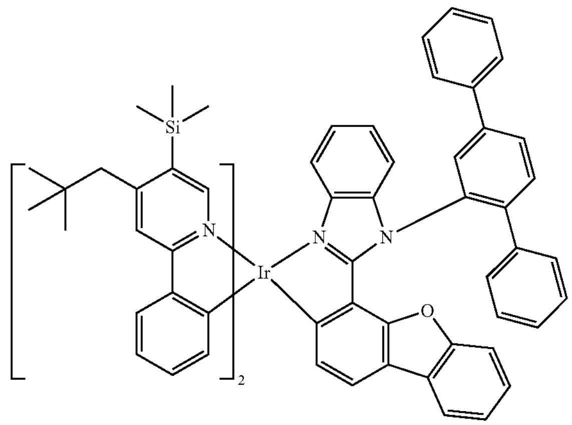
397
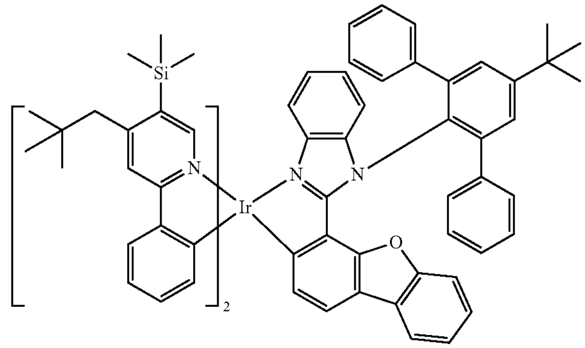

398
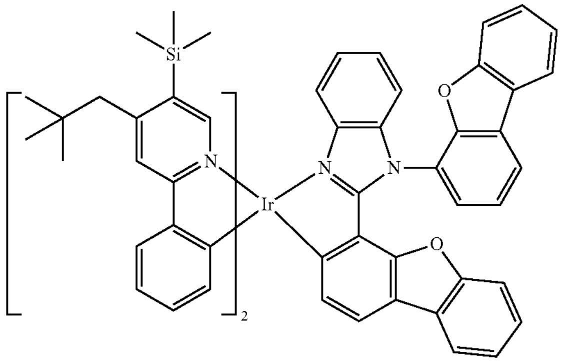
399
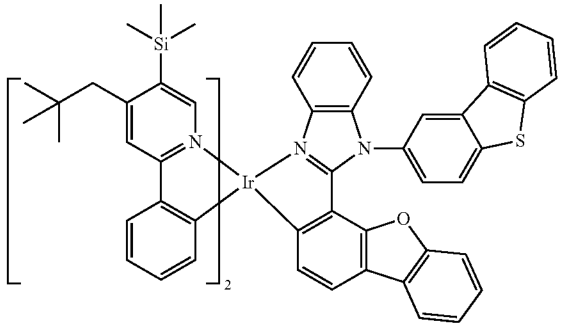
400
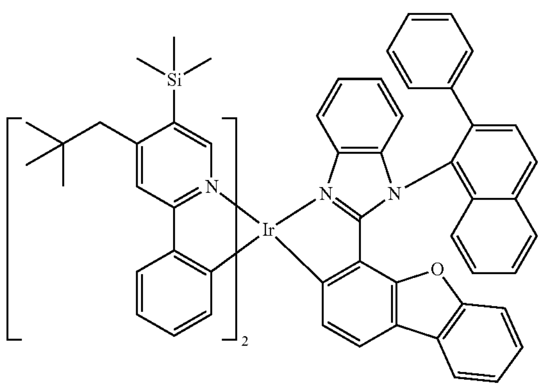
401
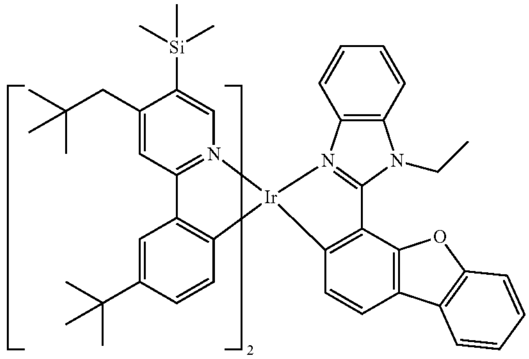
402
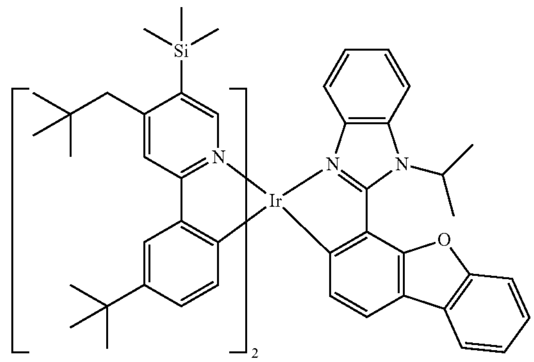
403
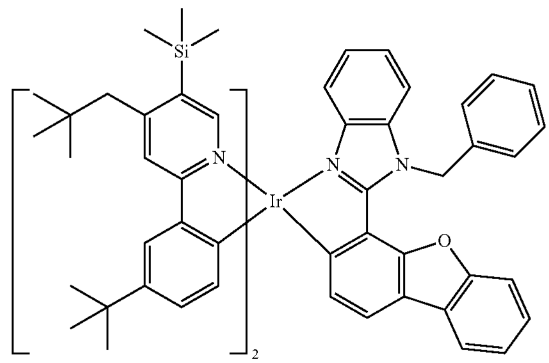
404
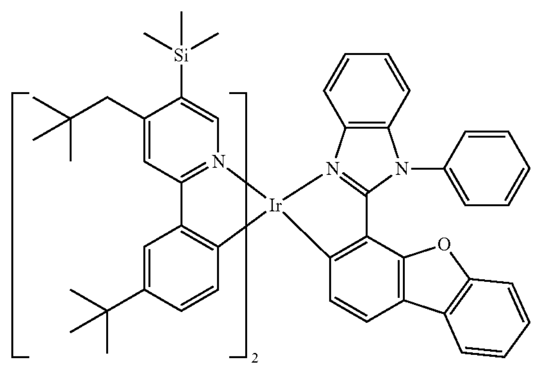
405
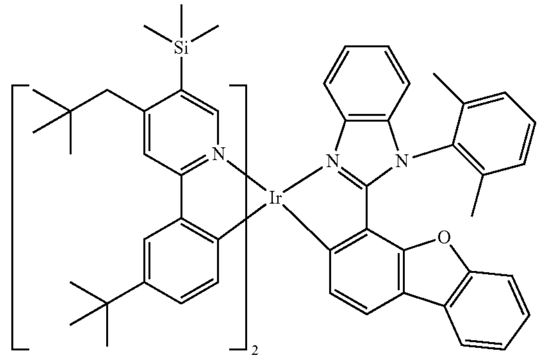

406
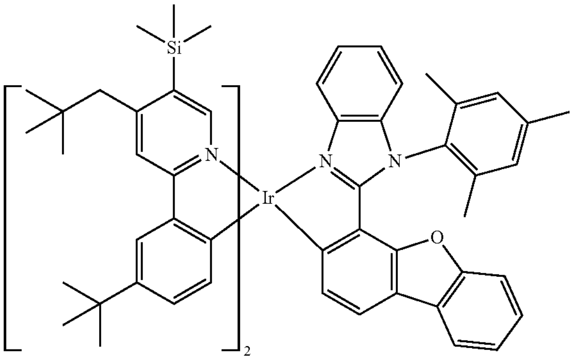
407
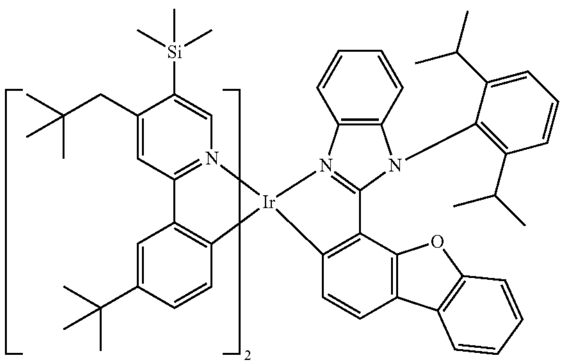
408
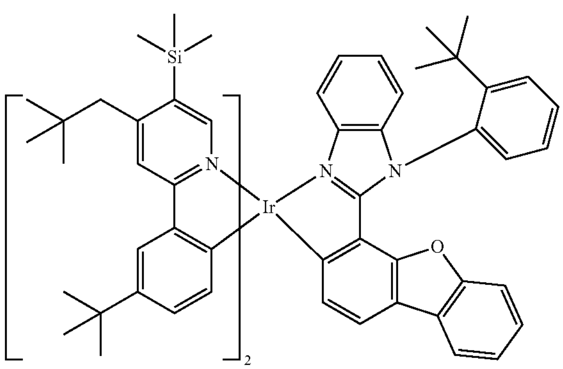
409
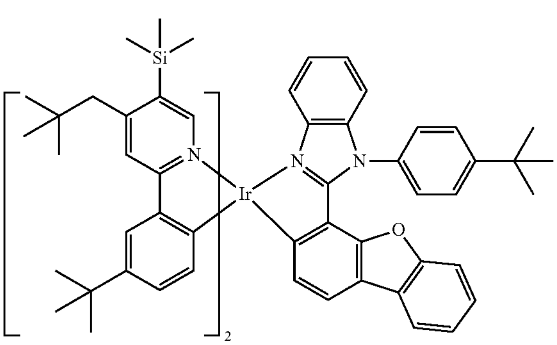
410
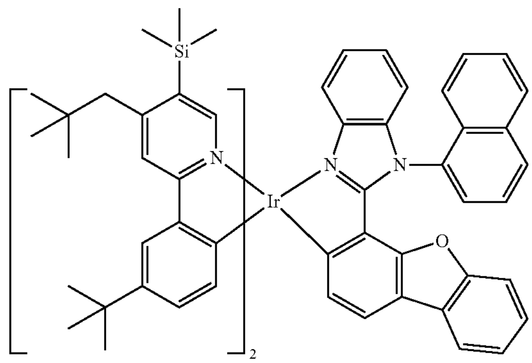
411
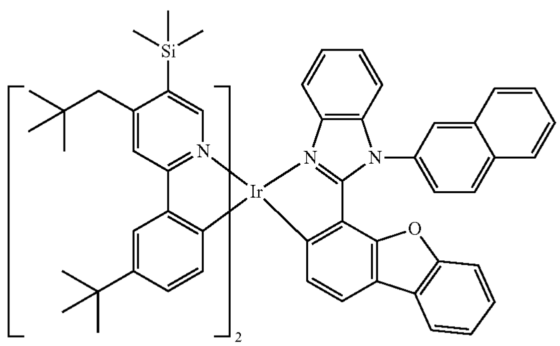
412
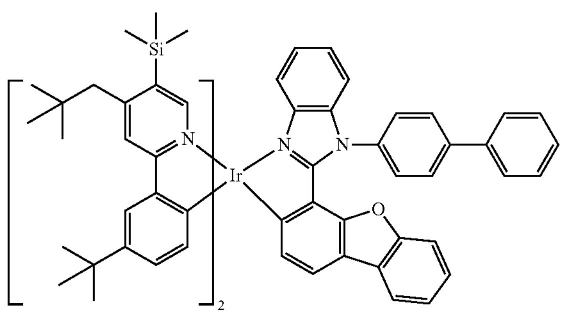
413
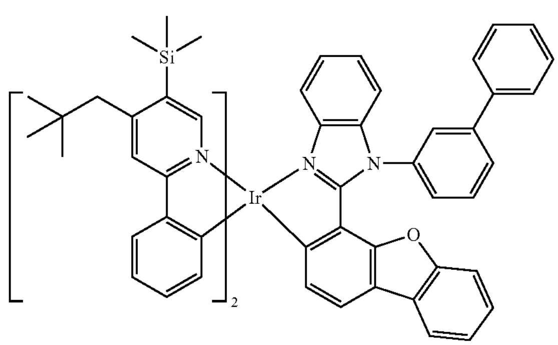

-continued
414
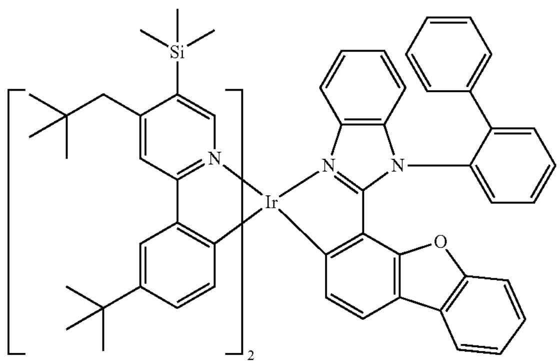
415
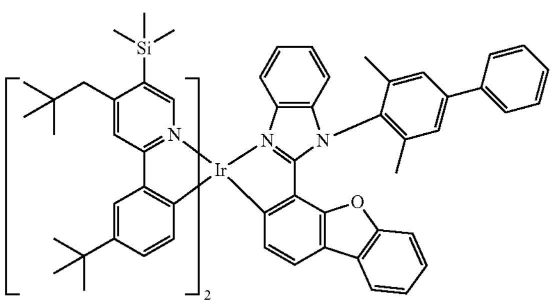
416
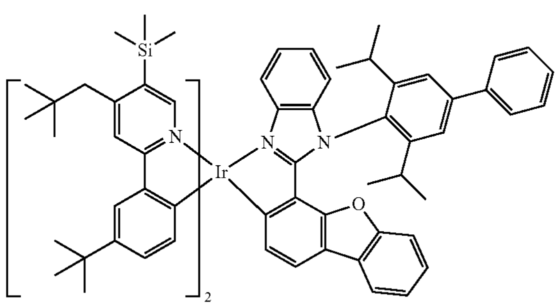
417
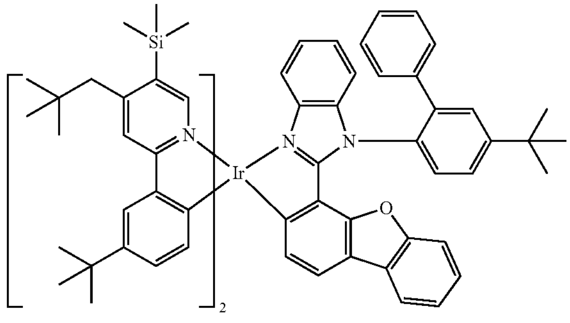
-continued
418
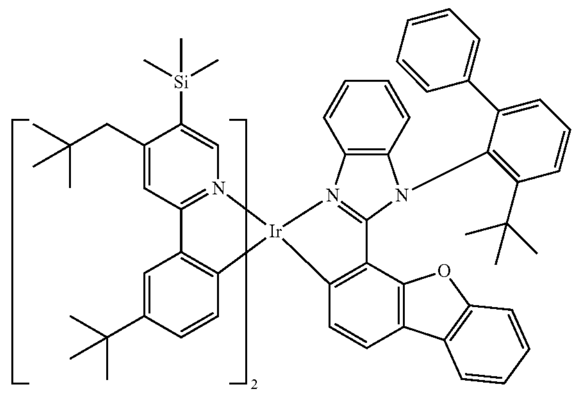
419
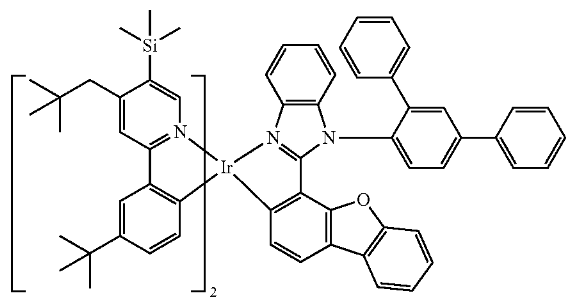
420
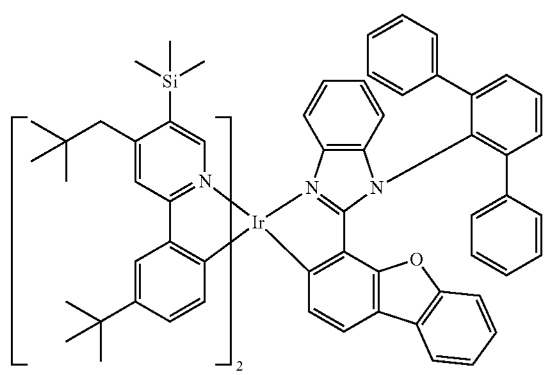
421
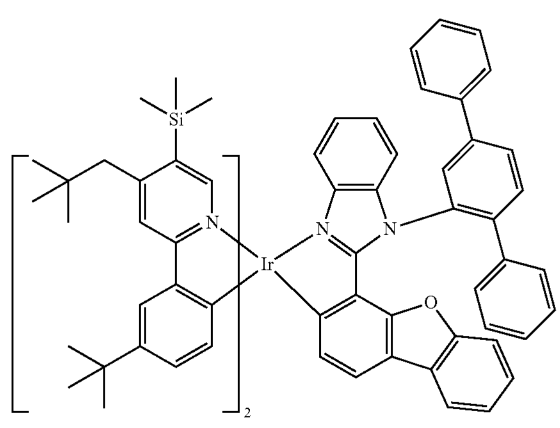

-continued
422
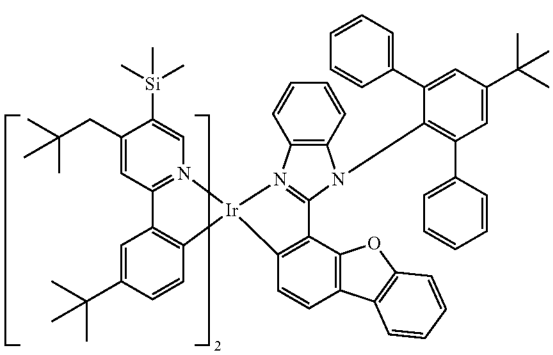
423
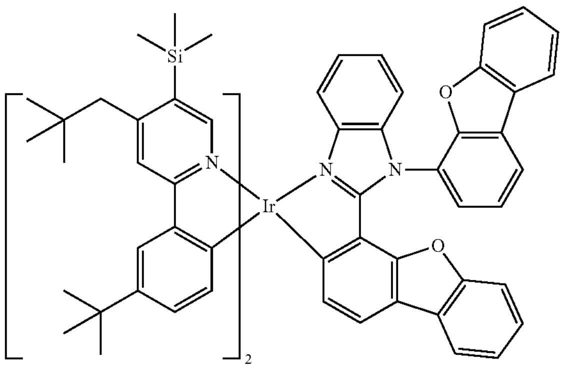
424
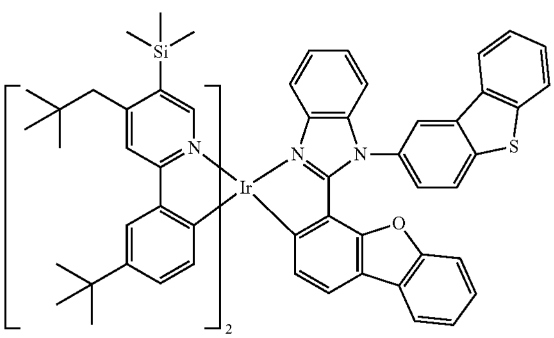
425
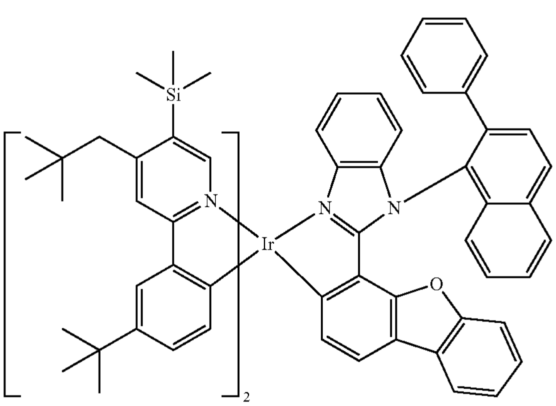
-continued
426
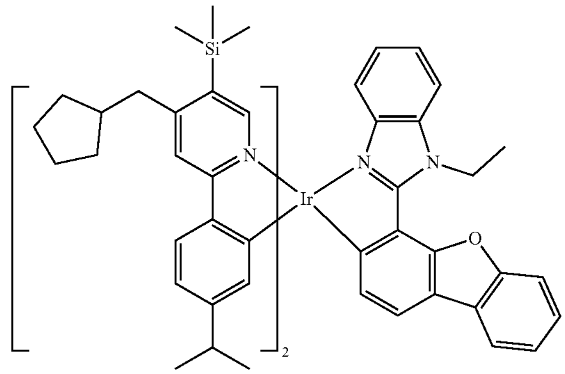
427
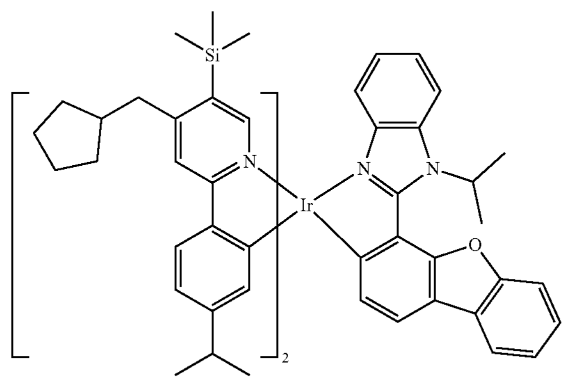
428
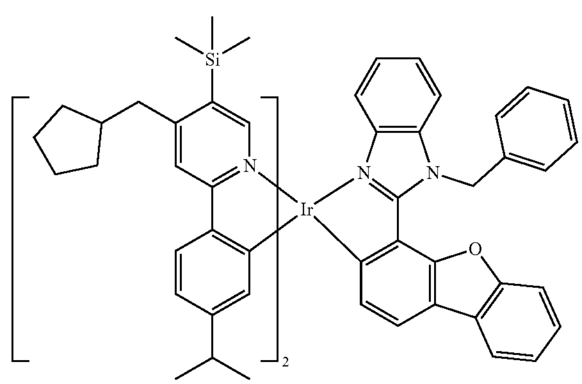
429
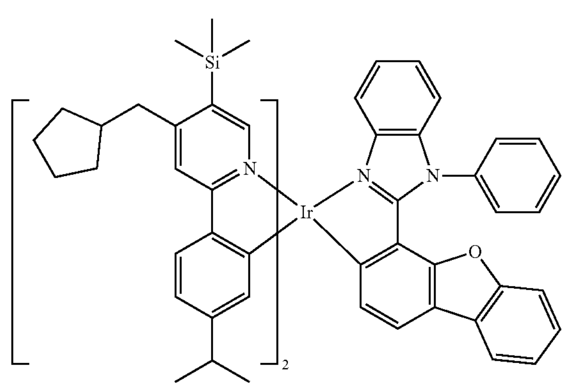

-continued
430
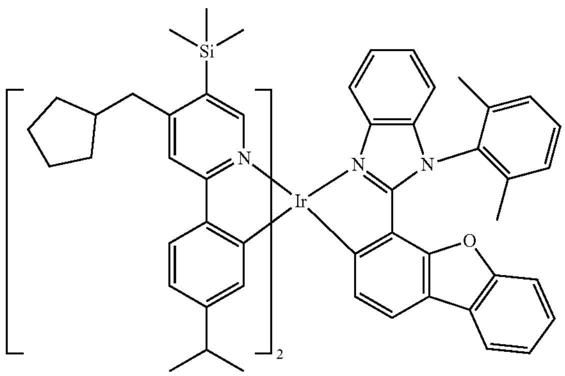
431
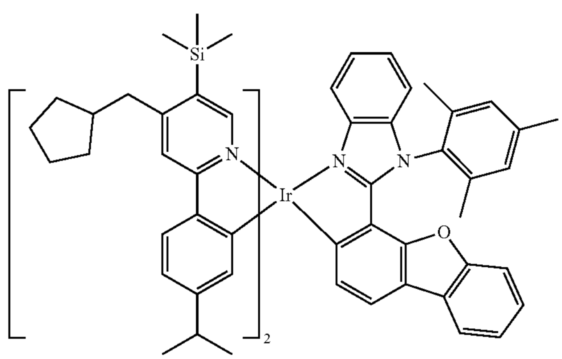
432
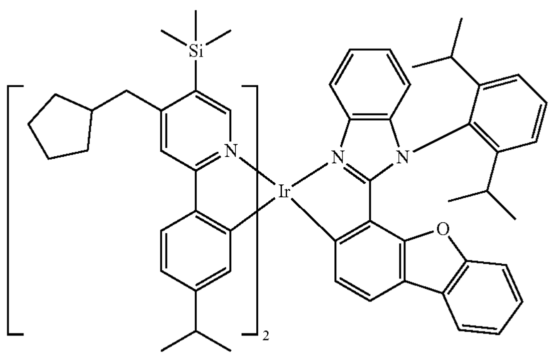
433
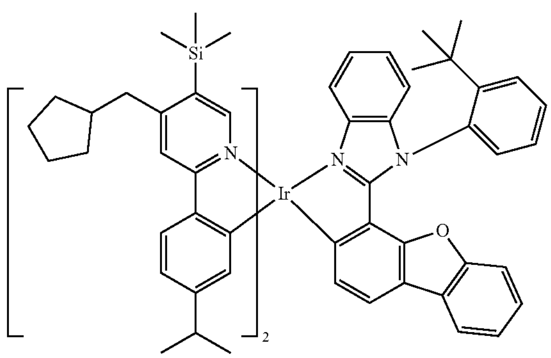
-continued
434
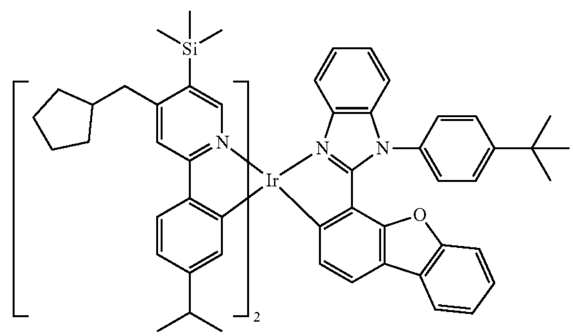
435
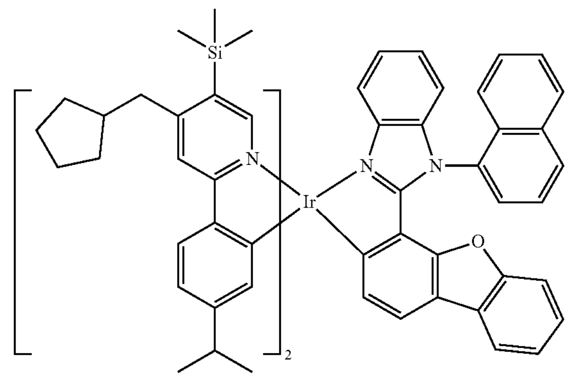
436
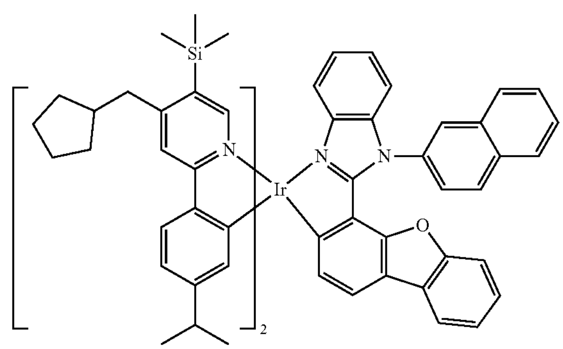
437
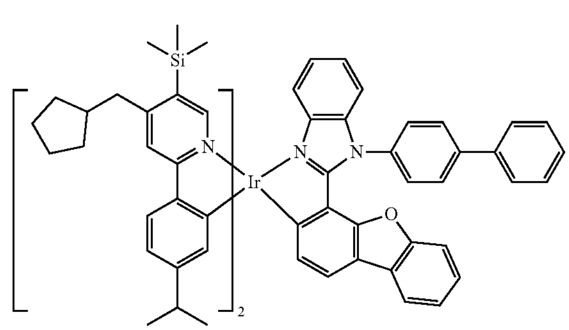

-continued
438
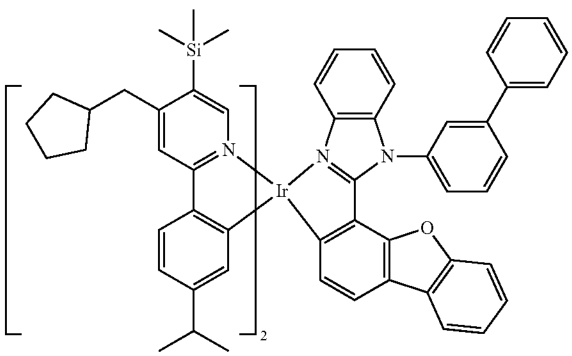
439
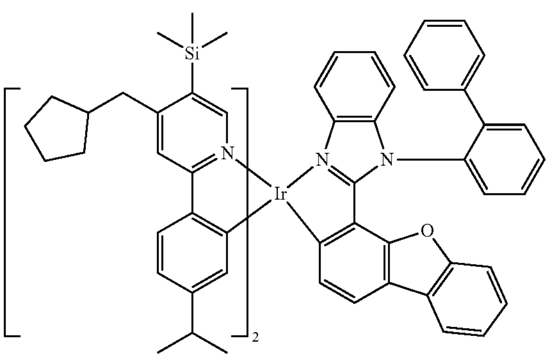
440
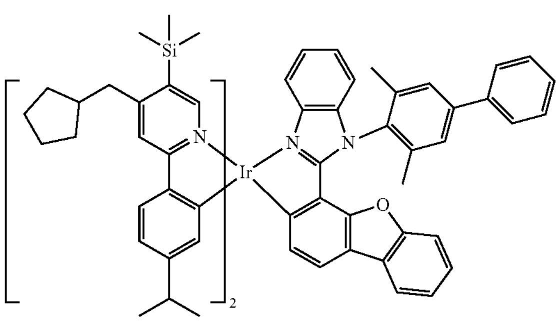
441
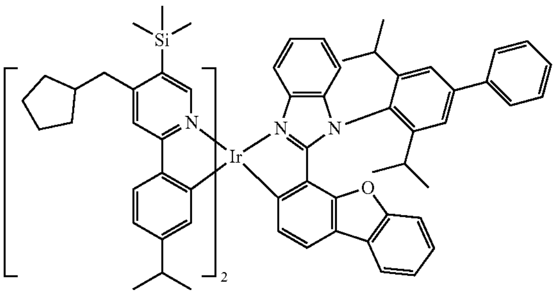
-continued
442
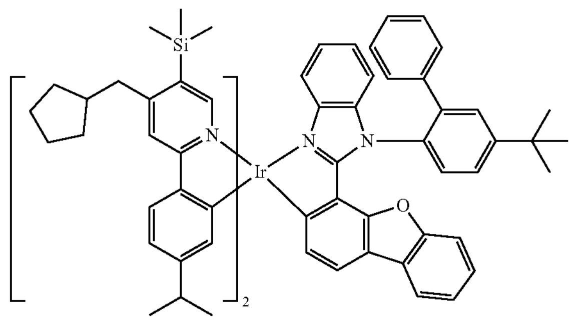
443
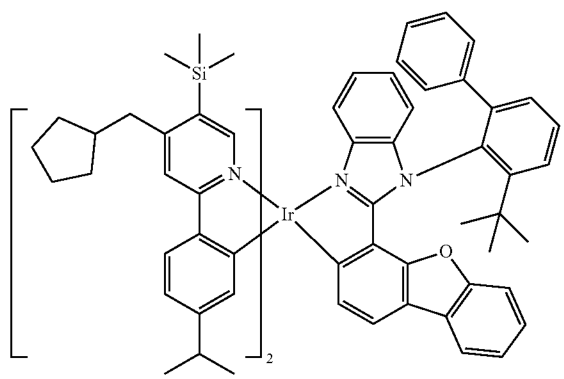
444
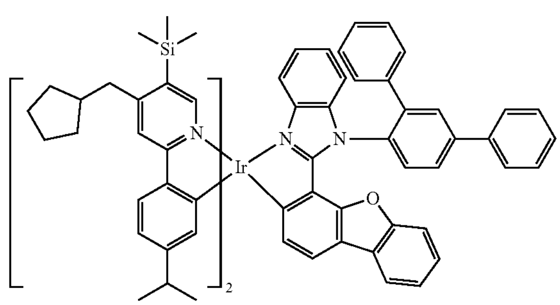
445
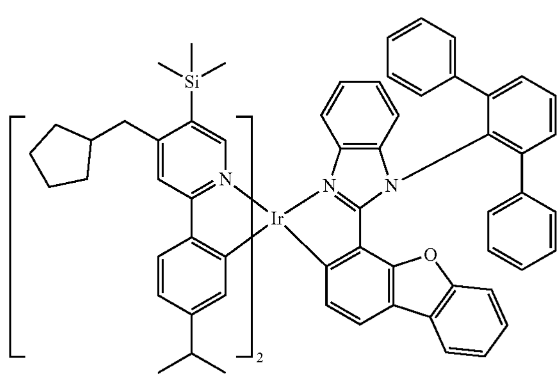

-continued
446
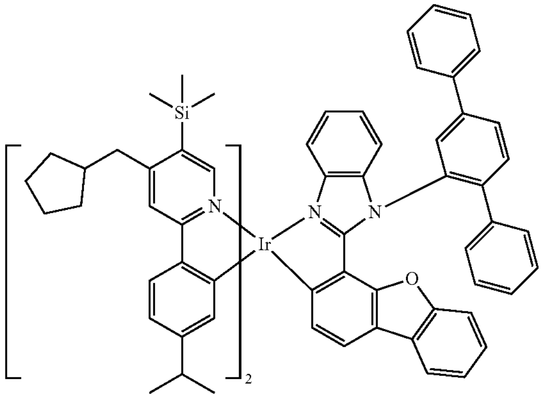
447
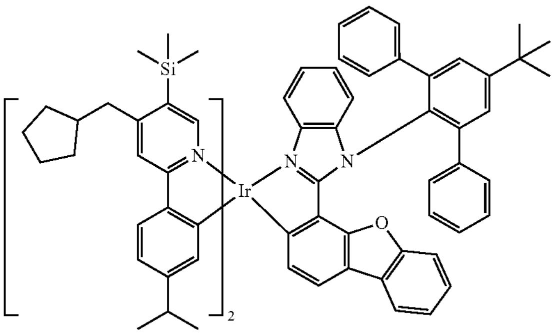
448
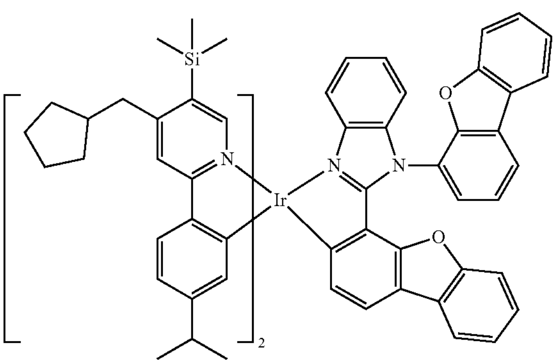
449
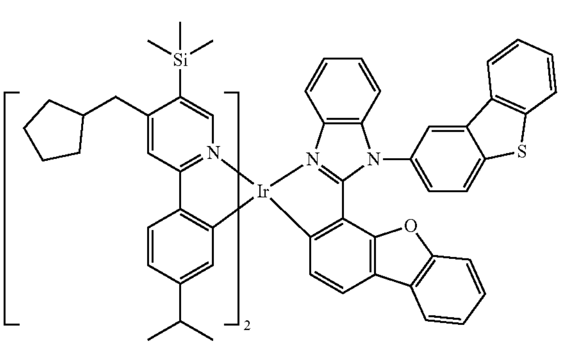
-continued
450
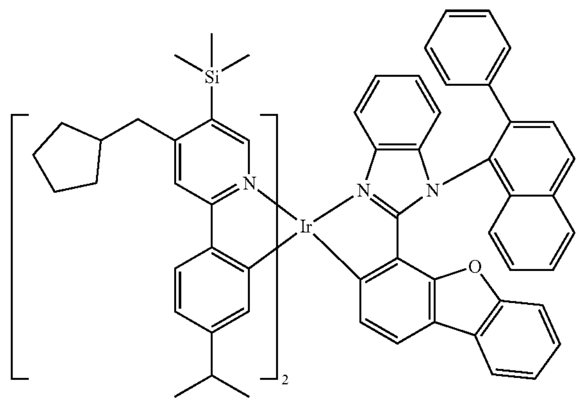
451
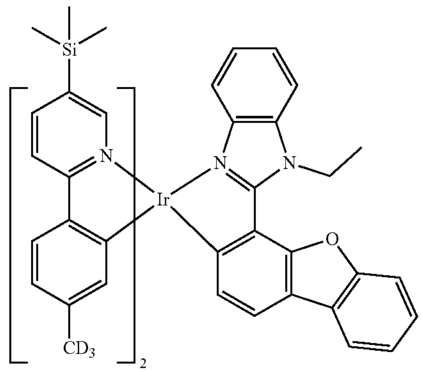
452
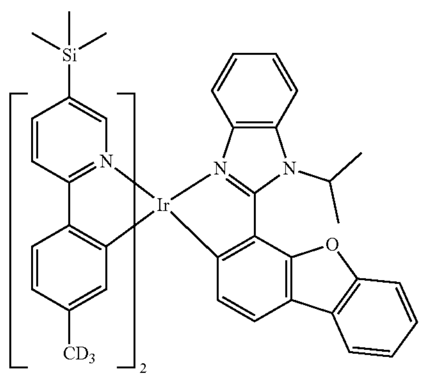
453
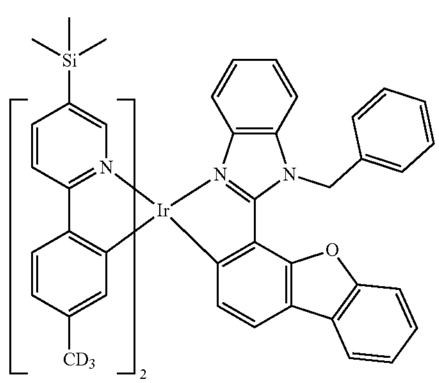

-continued
454
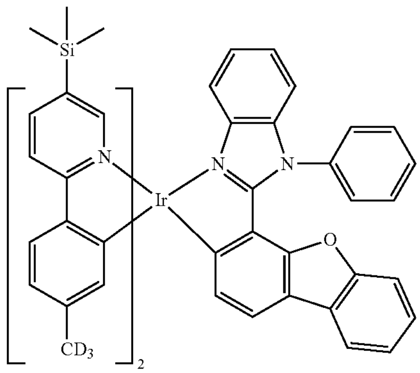
455
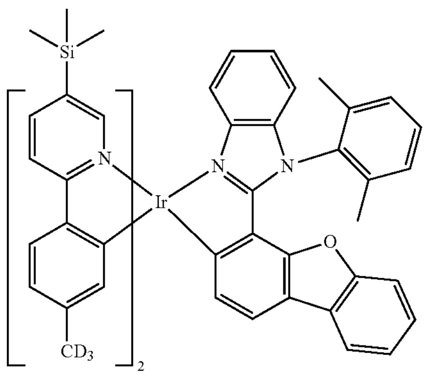
456
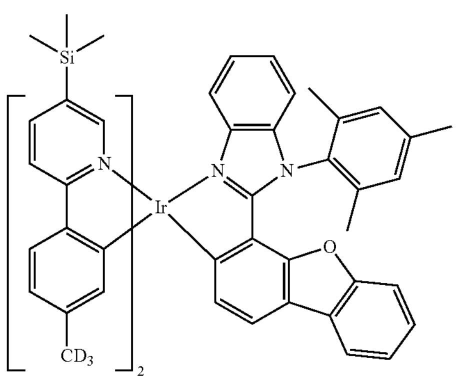
457
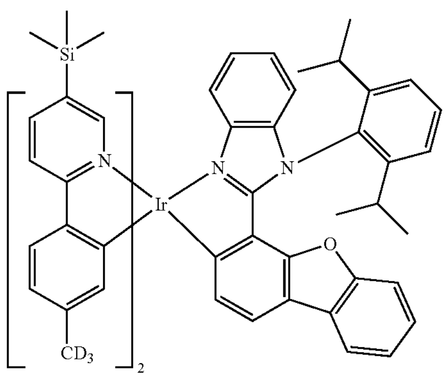
-continued
458
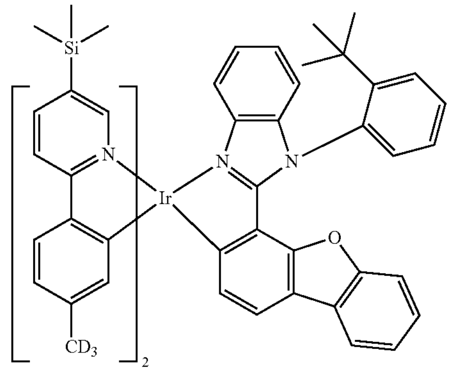
459
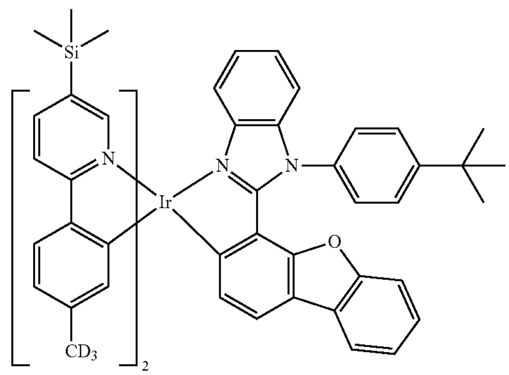
460
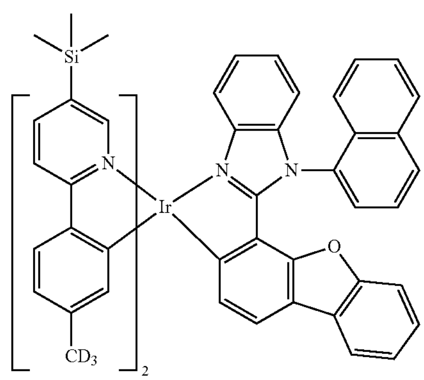
461
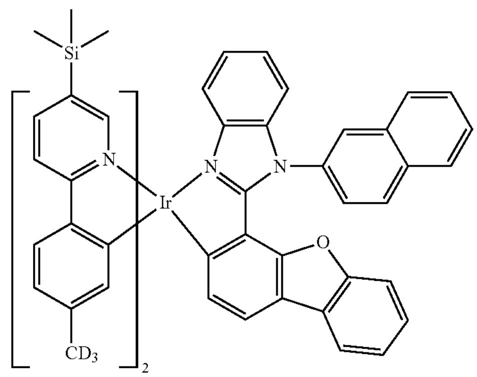

-continued
462
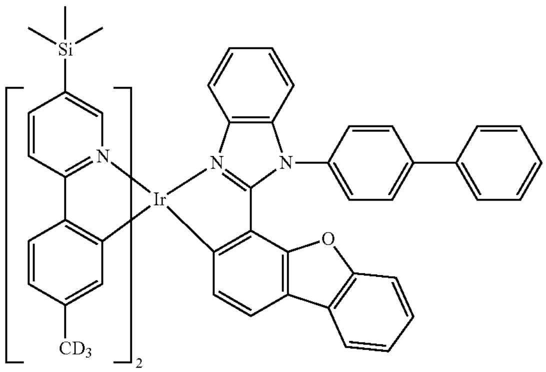
463
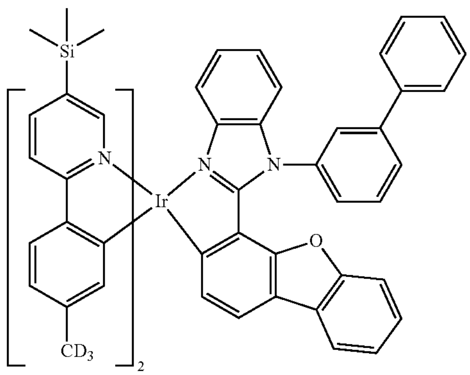
464
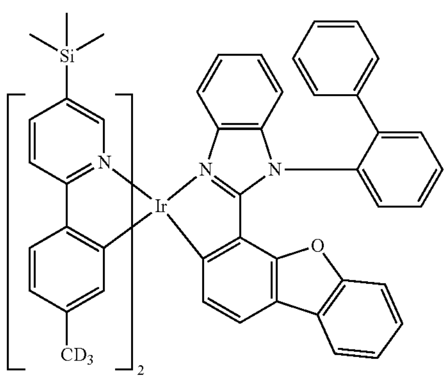
465
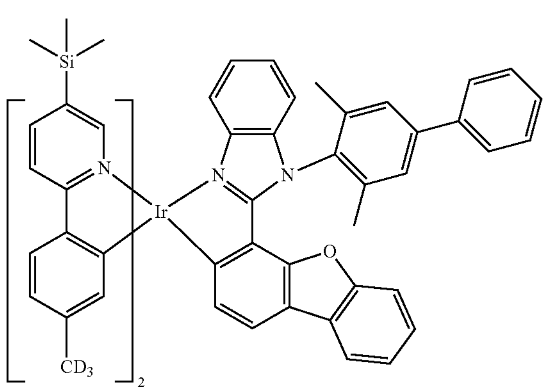
-continued
466
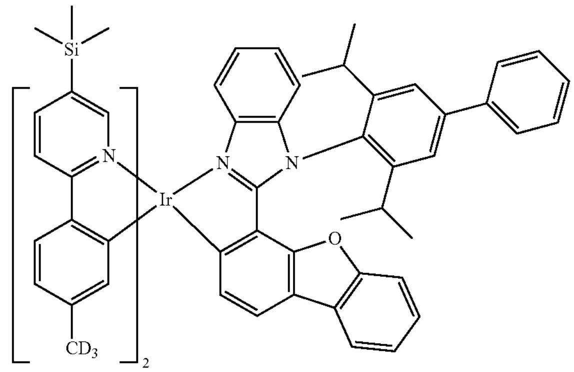
467
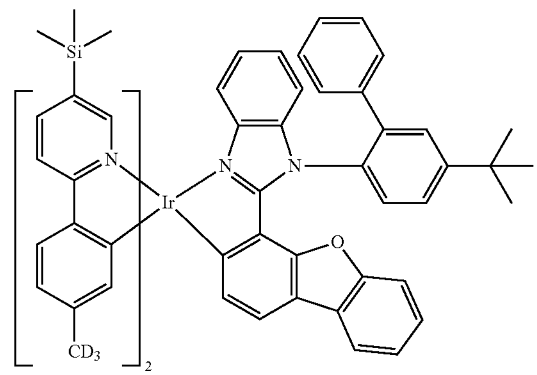
468
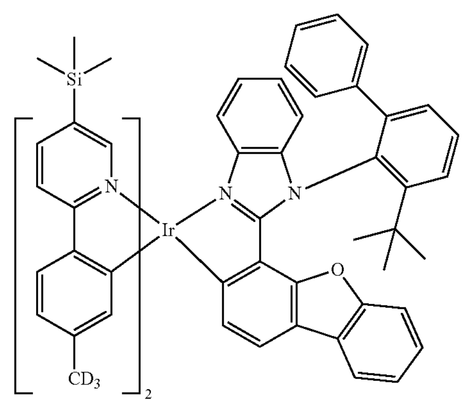
469
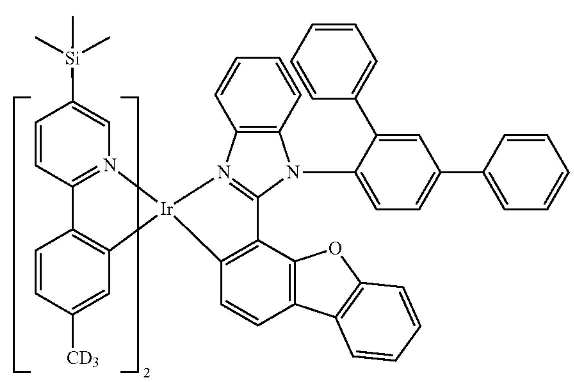

-continued
470
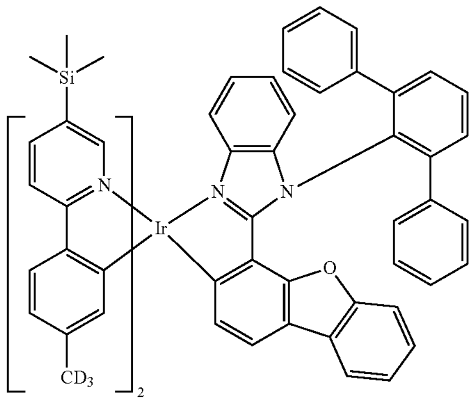
471
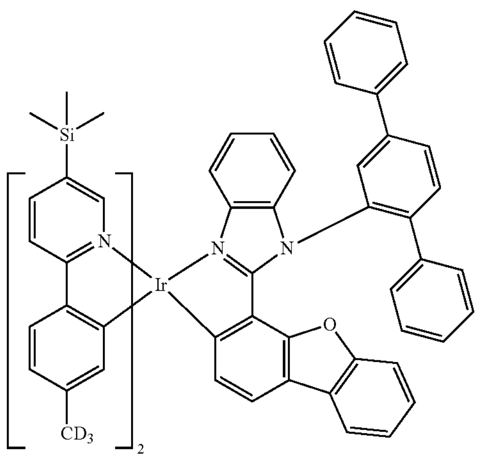
472
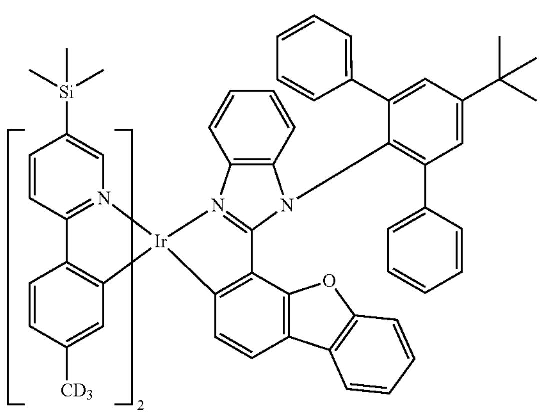
-continued
473
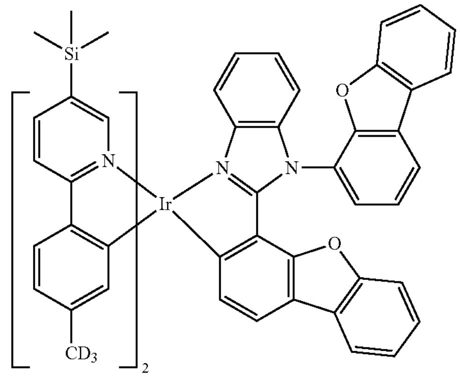
474
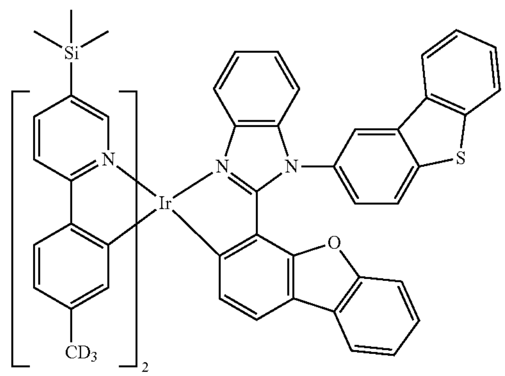
475
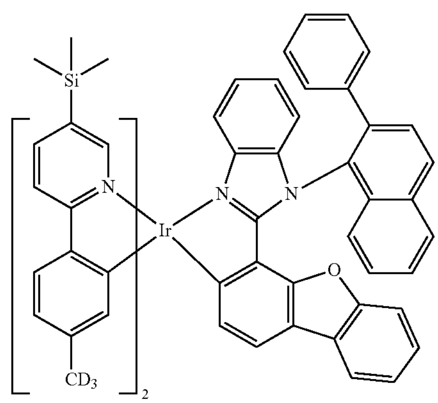
476
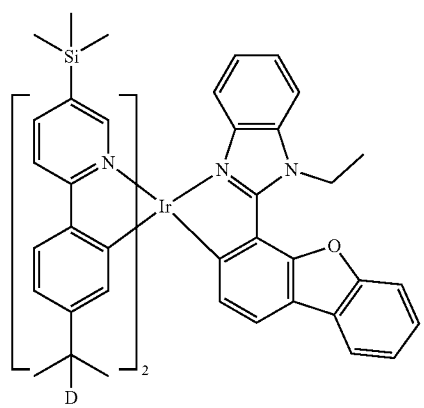

-continued
477
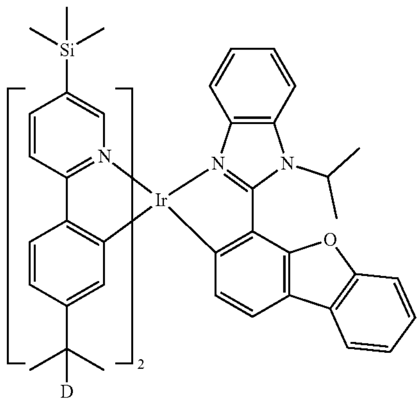
478
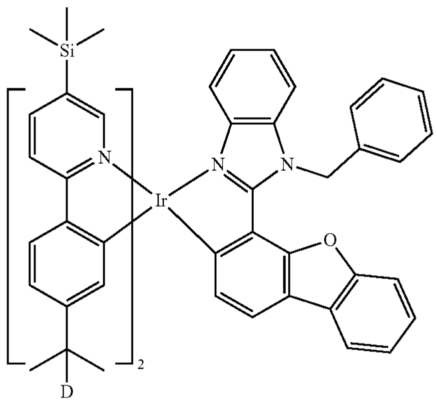
479
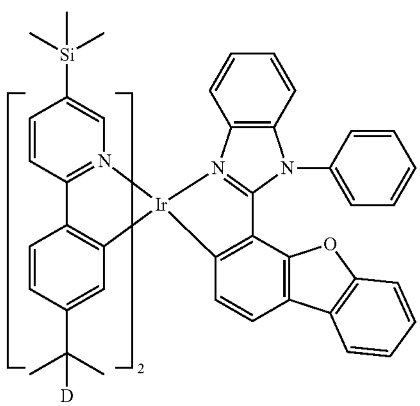
480
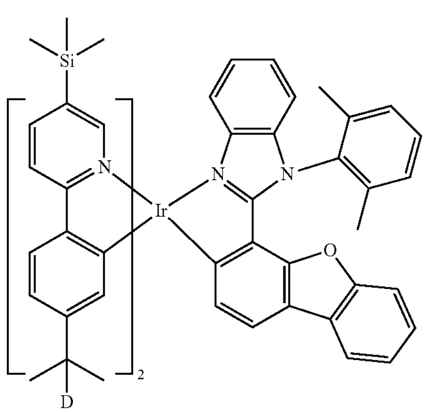
-continued
481
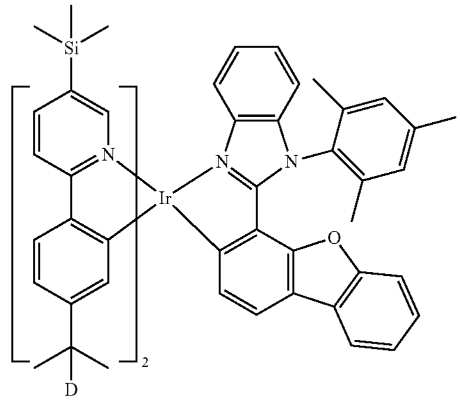
482
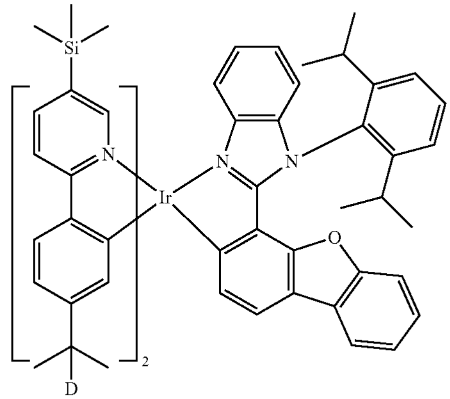
483
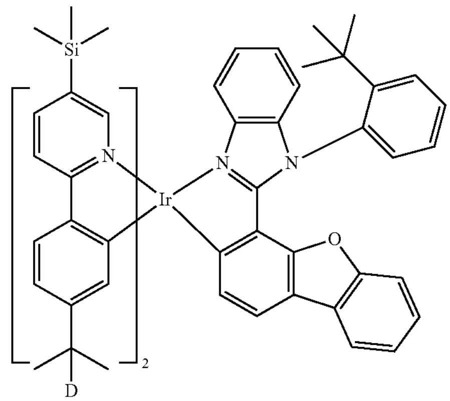
484
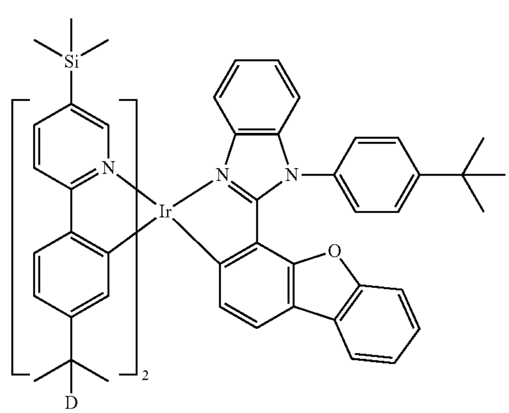

-continued
485
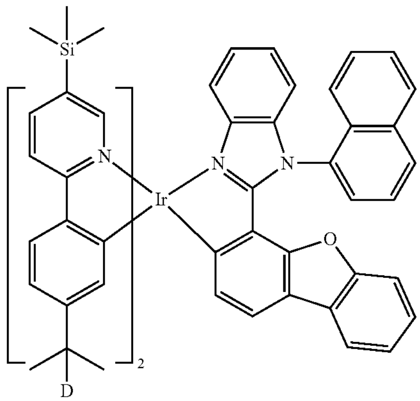
486
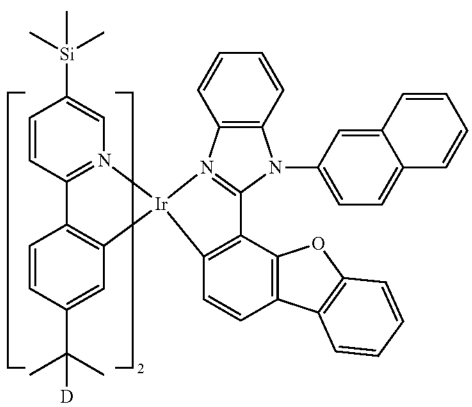
487
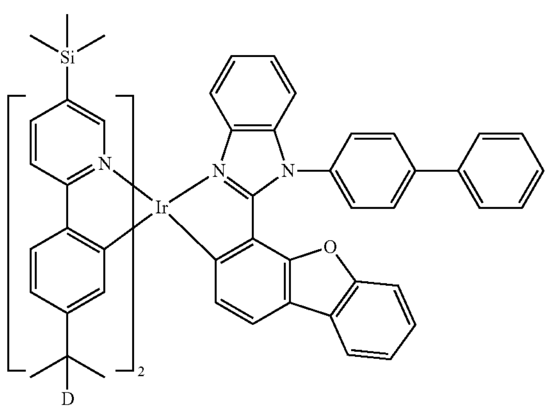
488
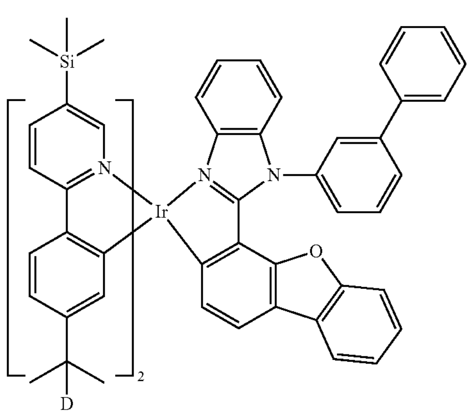
-continued
489
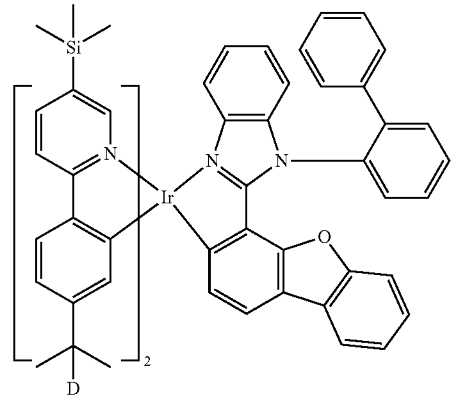
490
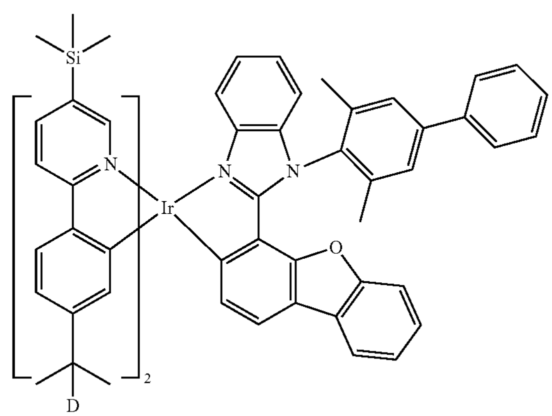
491
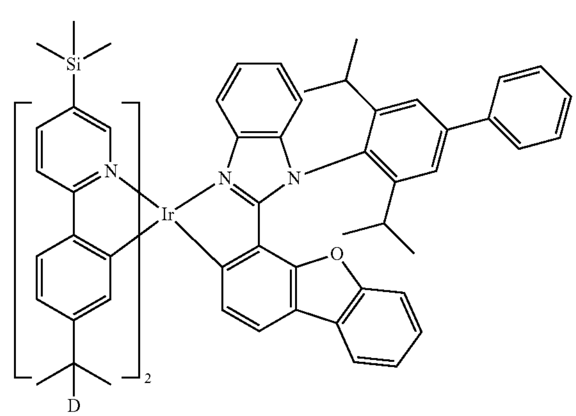

-continued
492
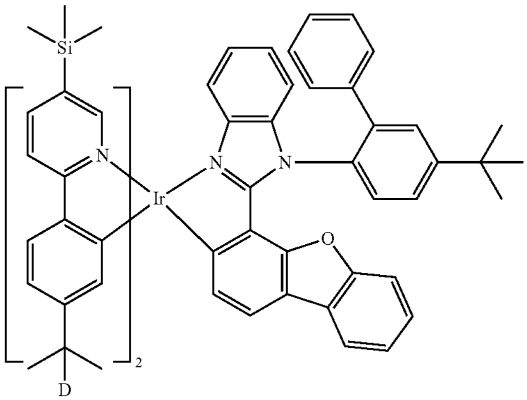
493
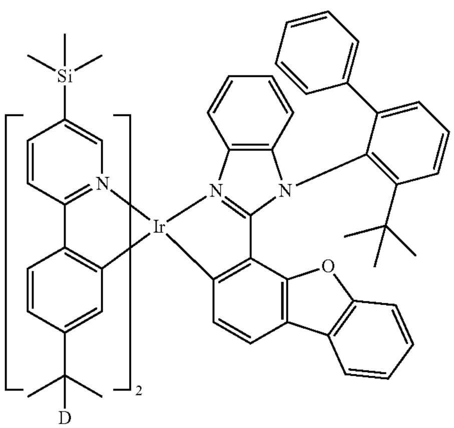
494
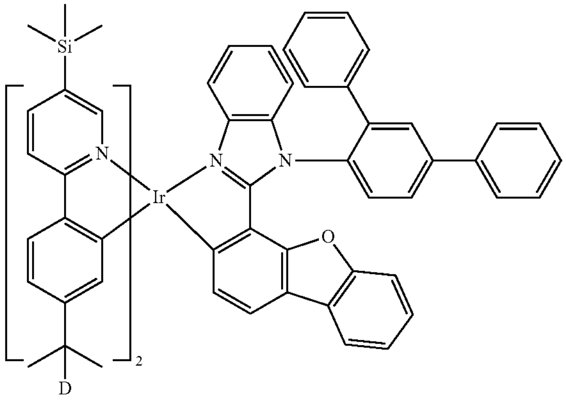
-continued
495
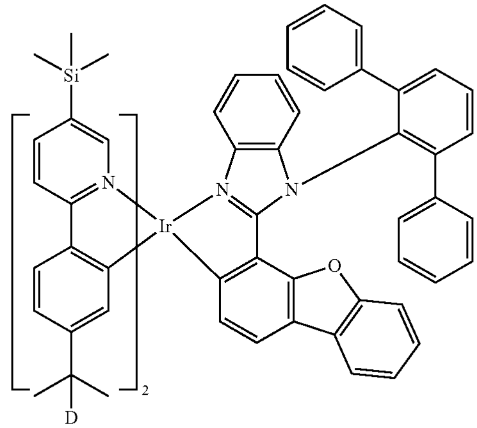
496
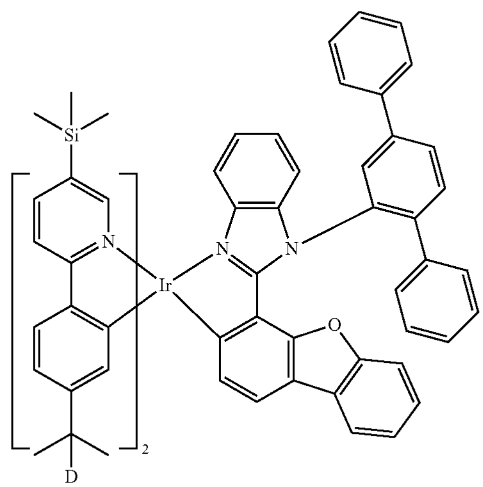
497
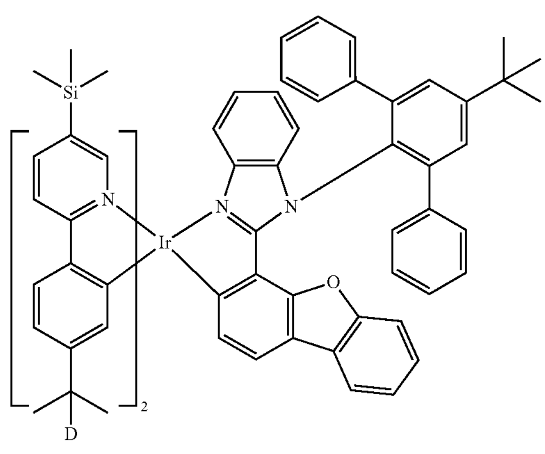

-continued
498
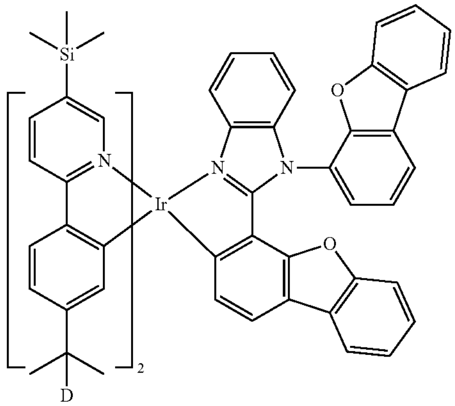
499
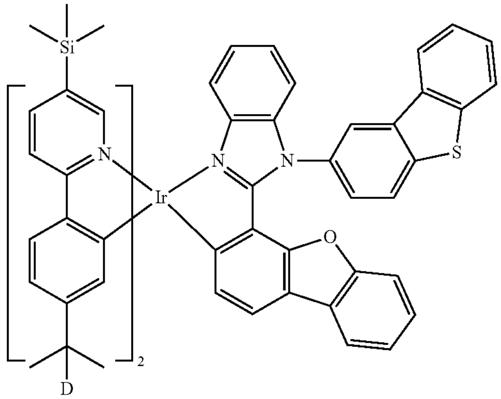
500
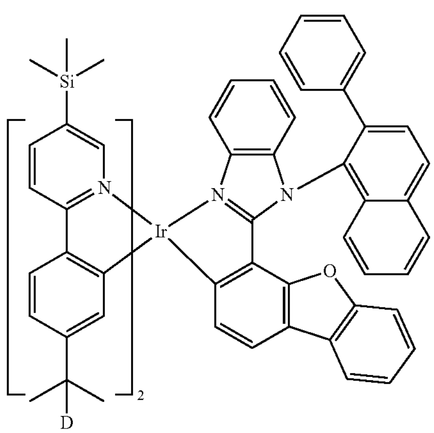
501
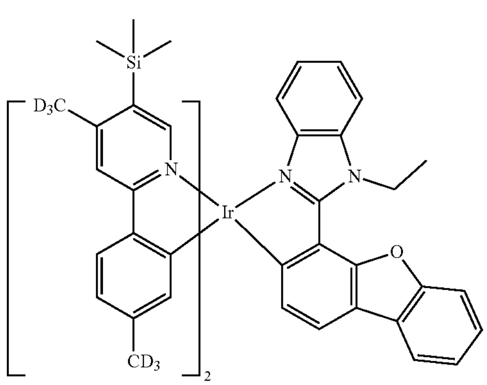
-continued
502
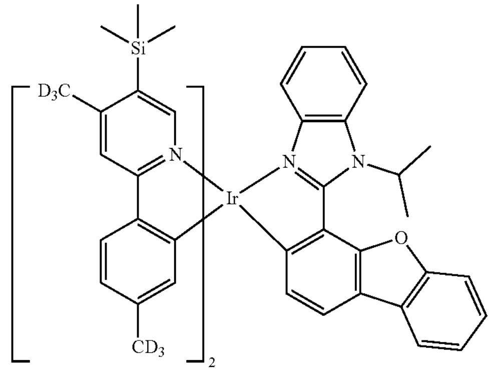
503
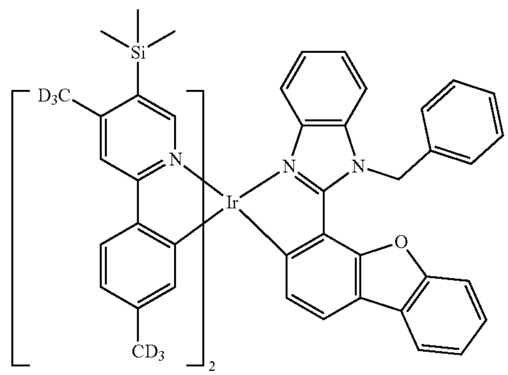
504
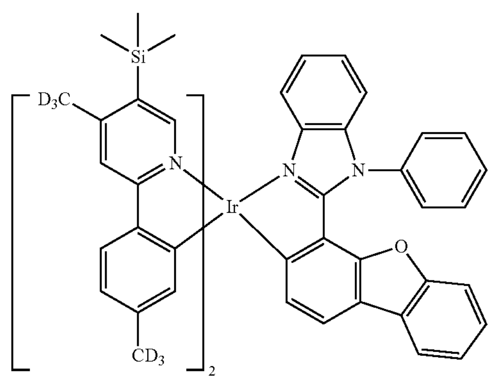
505
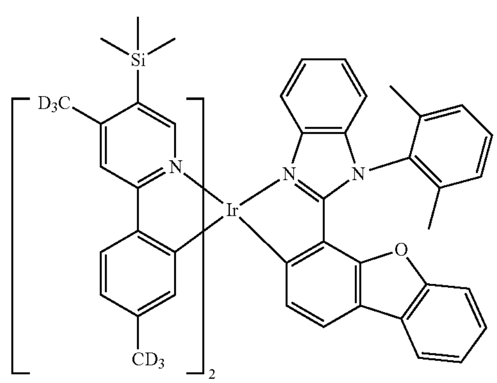

506
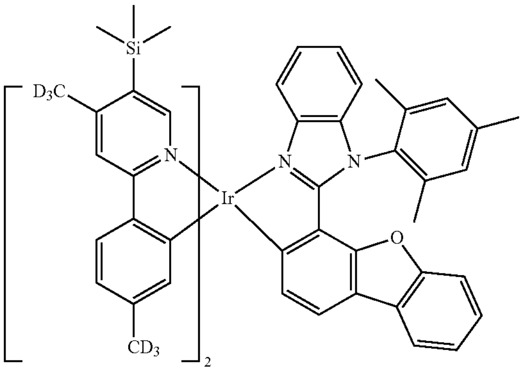
507
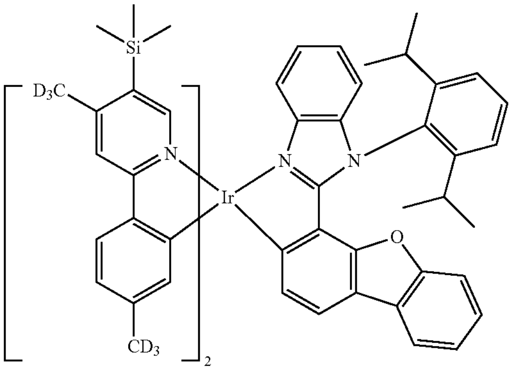
508
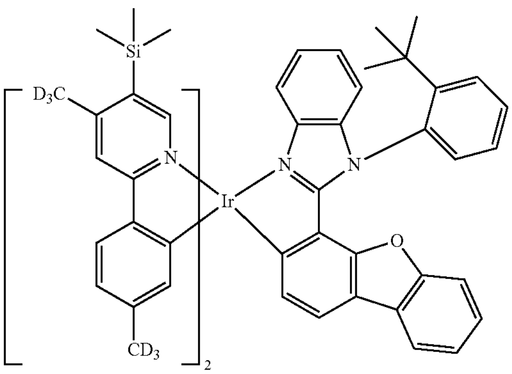
509
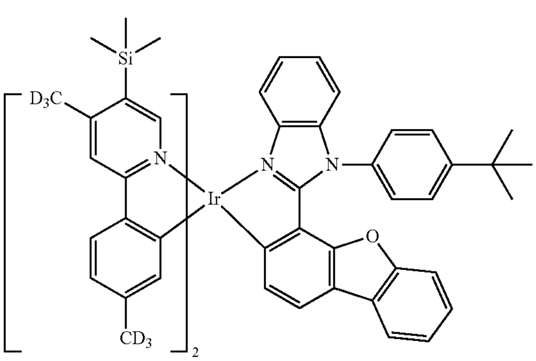
510
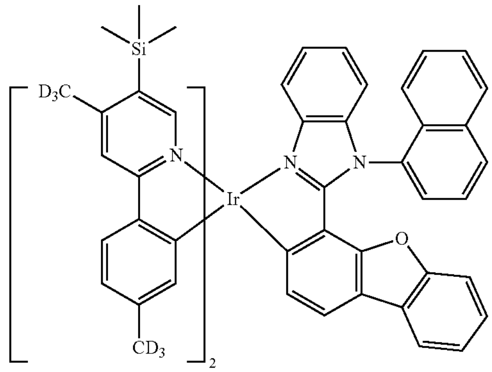
511
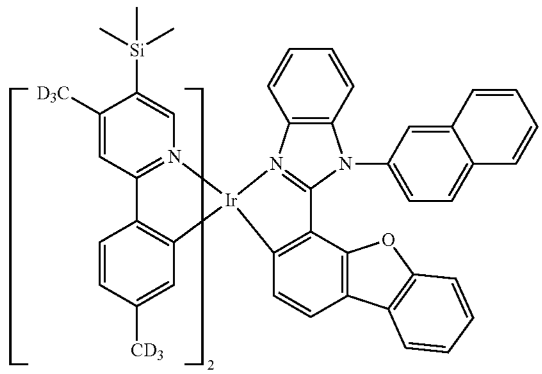
512
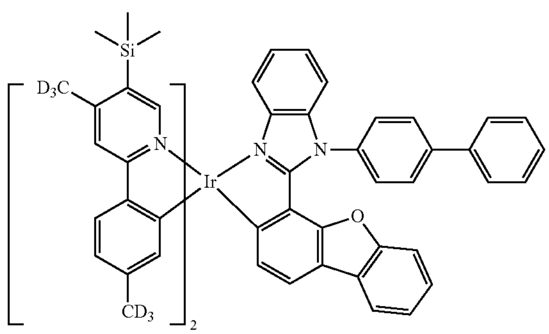
513
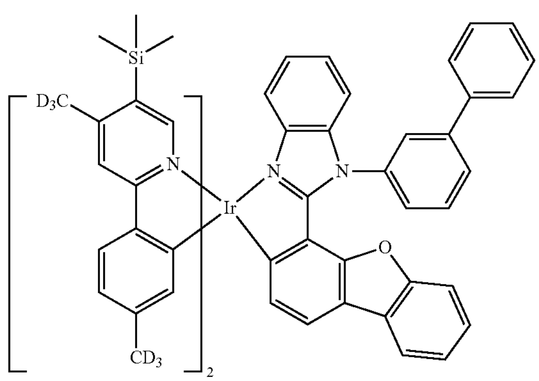

-continued
514
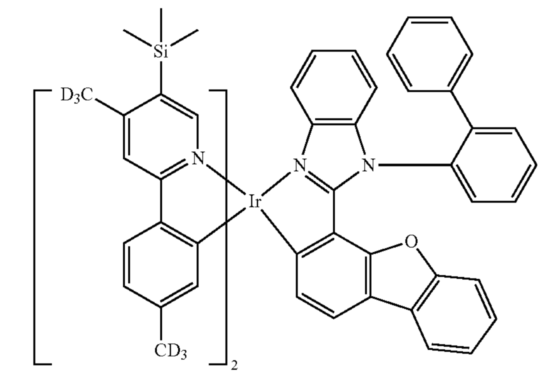
515
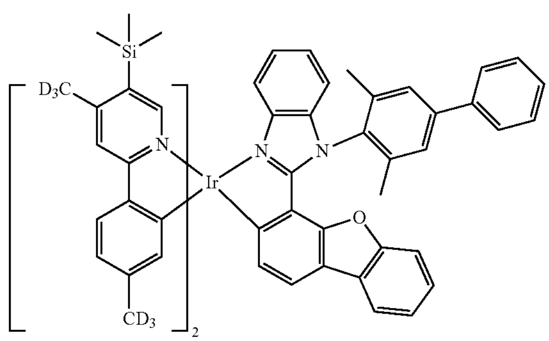
516
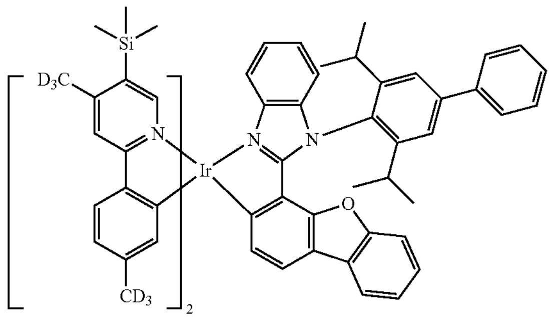
517
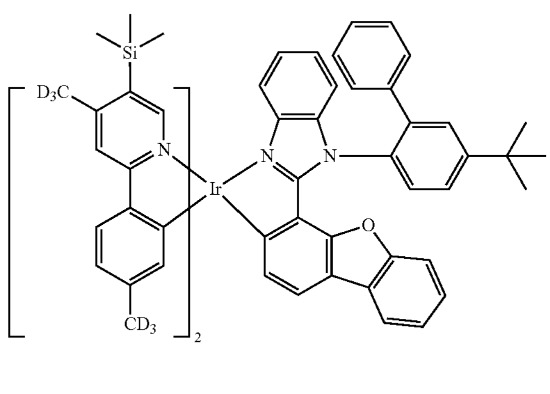
-continued
518
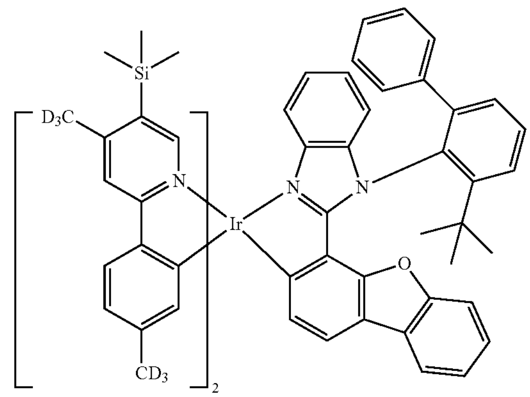
519
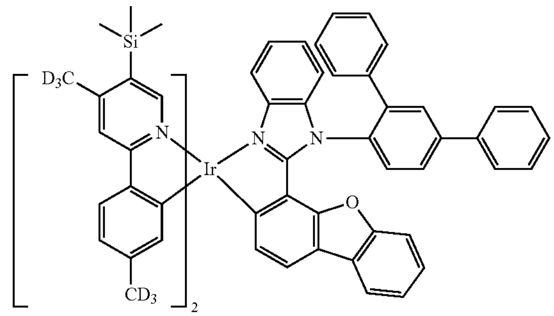
520
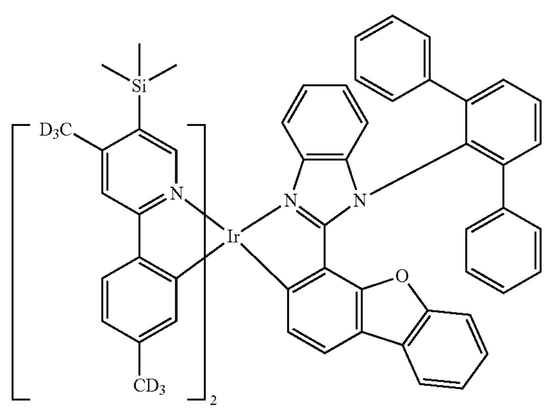
521
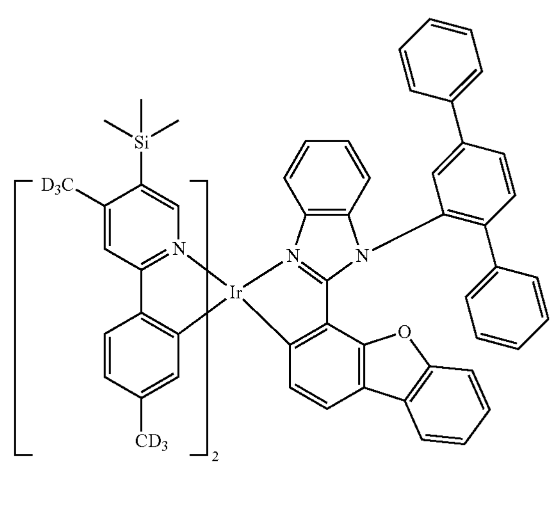

-continued
522
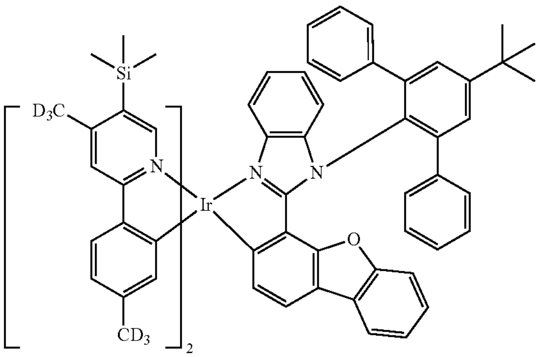
523
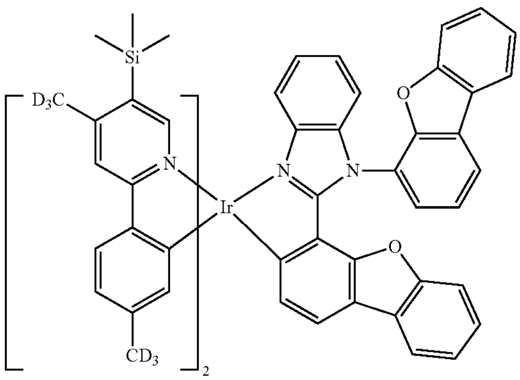
524
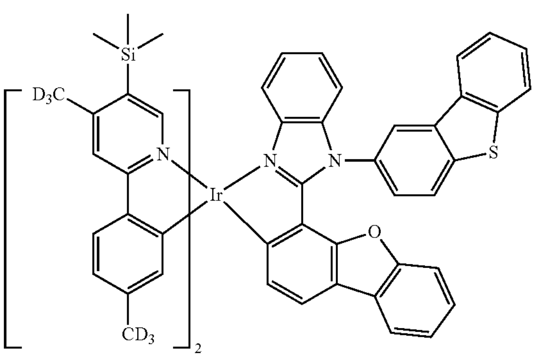
525
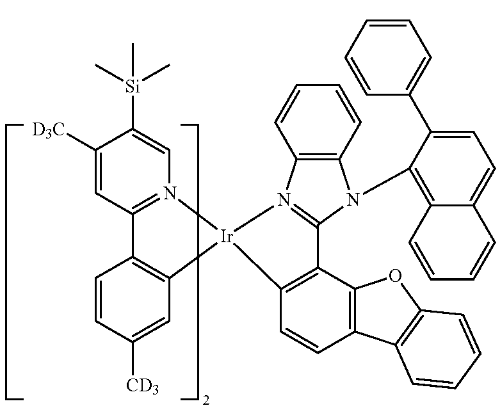
526
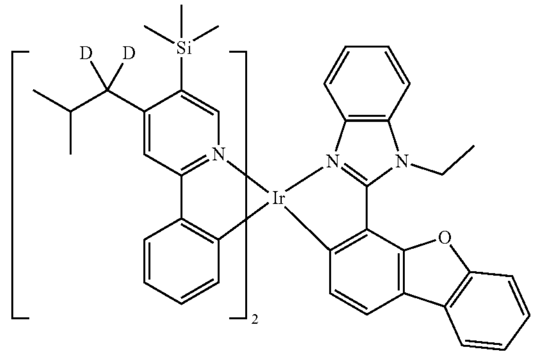
527
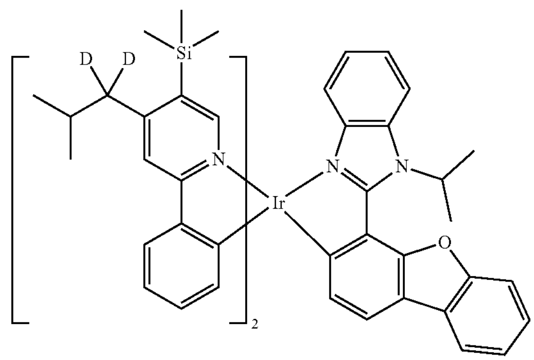
528
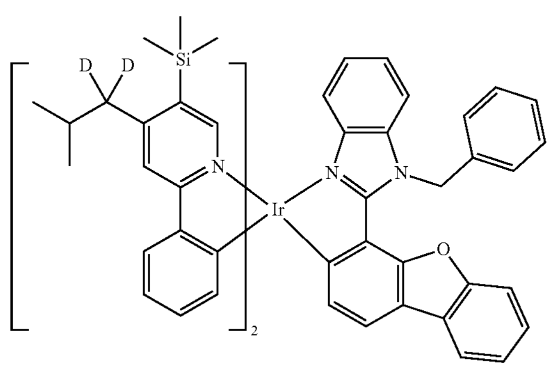
529
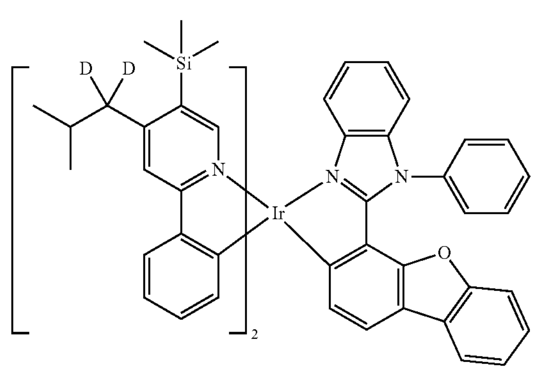

530
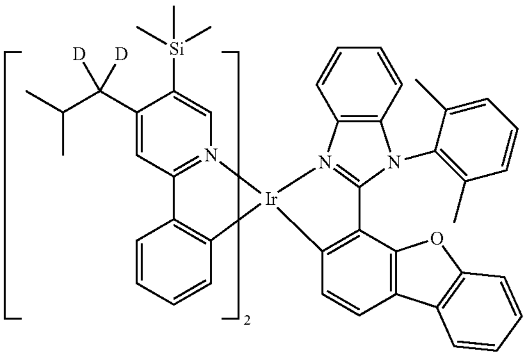
531
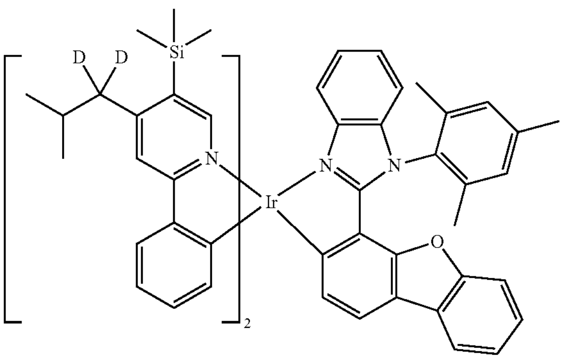
532
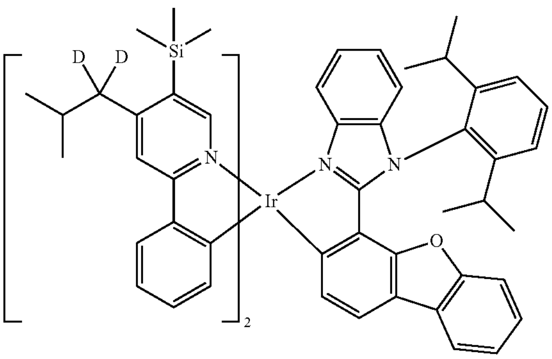
533
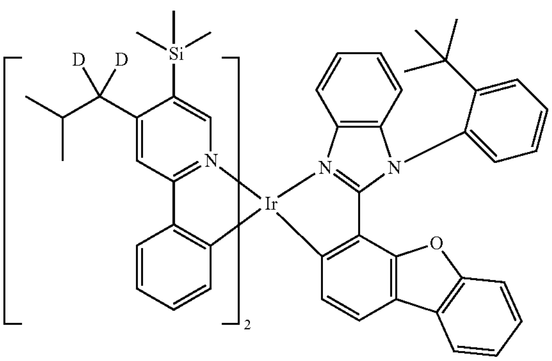
534
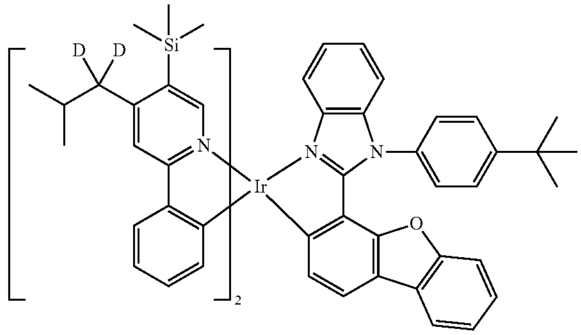
535
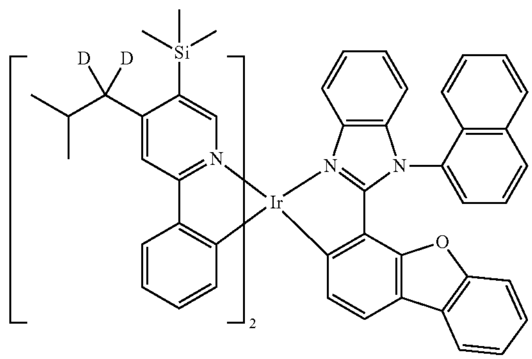
536
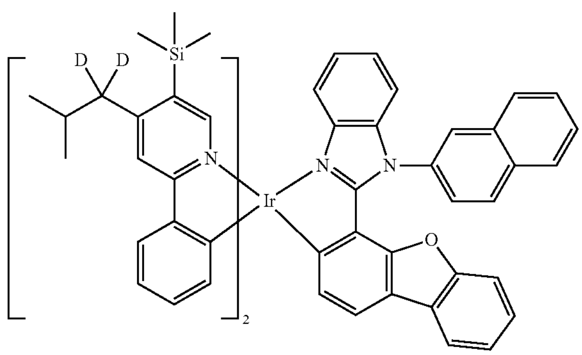
537
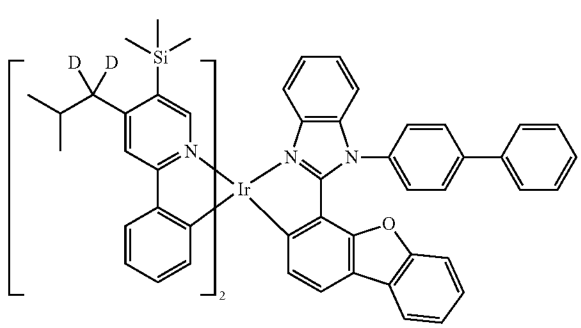

-continued
538
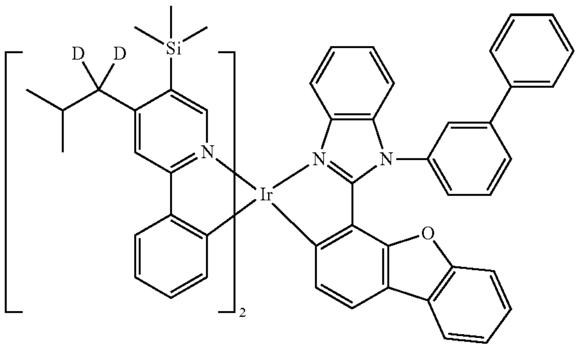
539
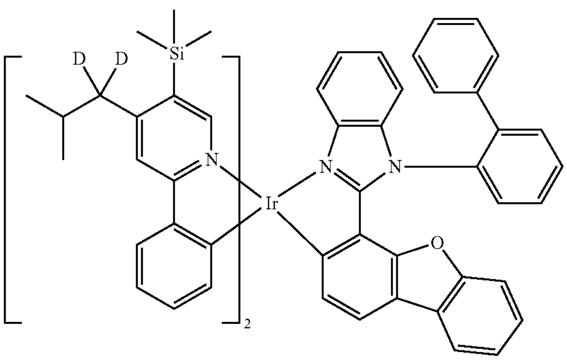
540
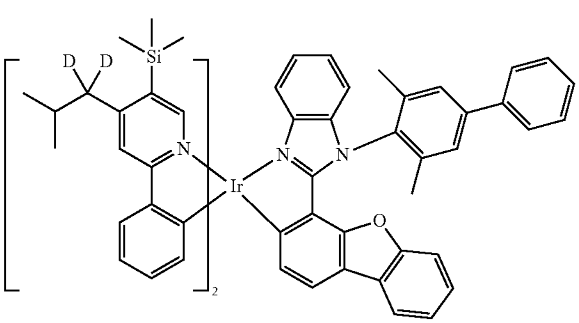
541
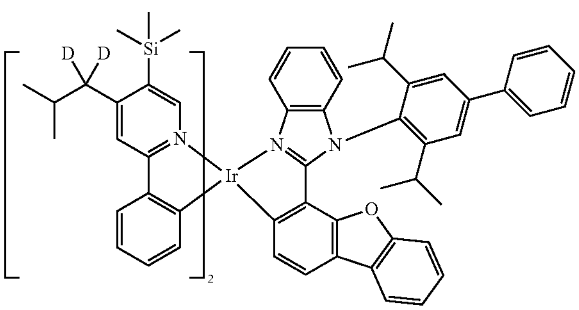
-continued
542
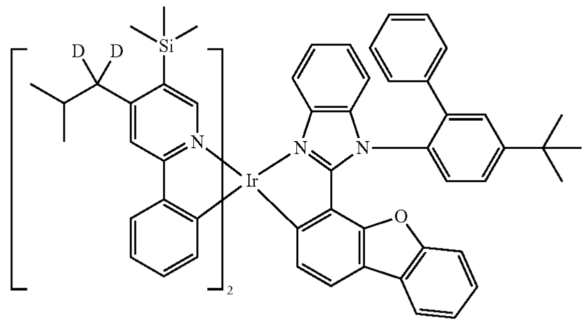
543
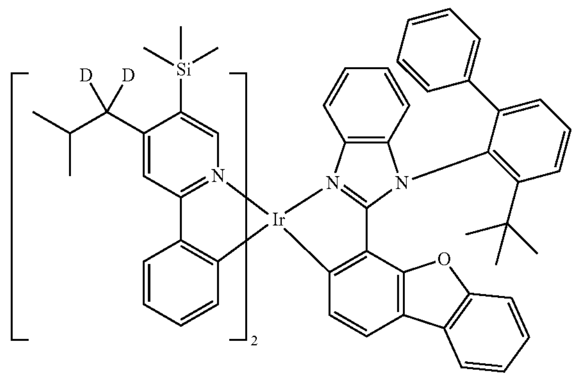
544
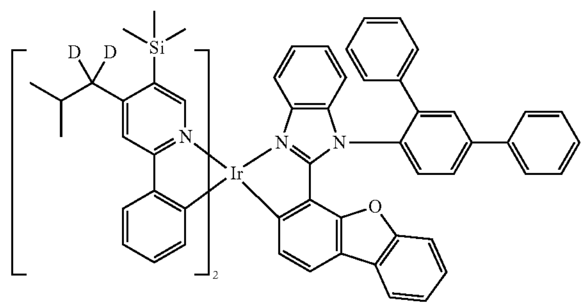
545
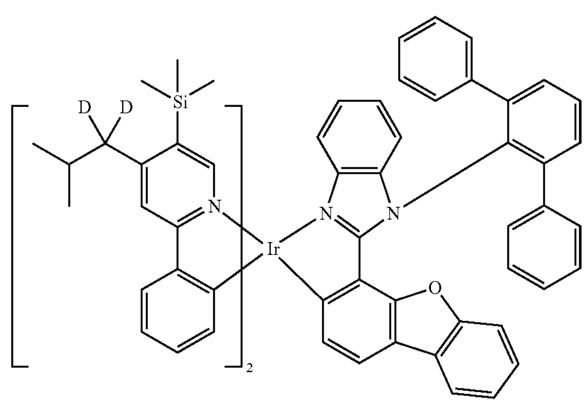

-continued
546
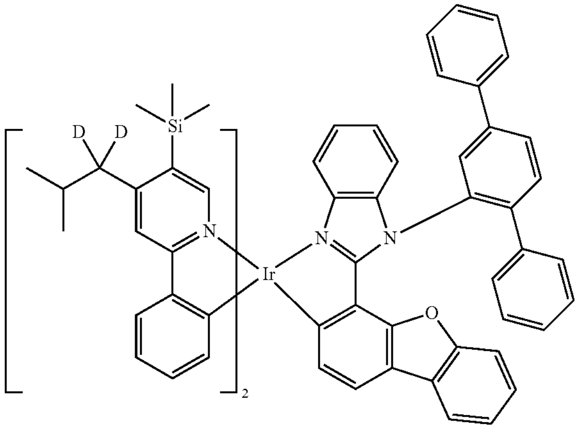
547
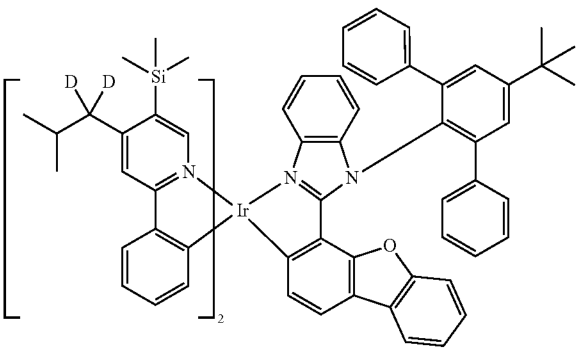
548
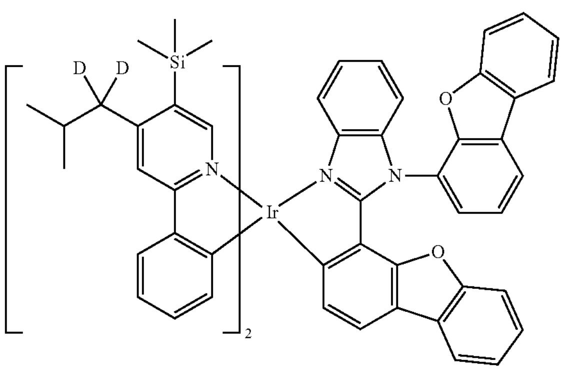
549
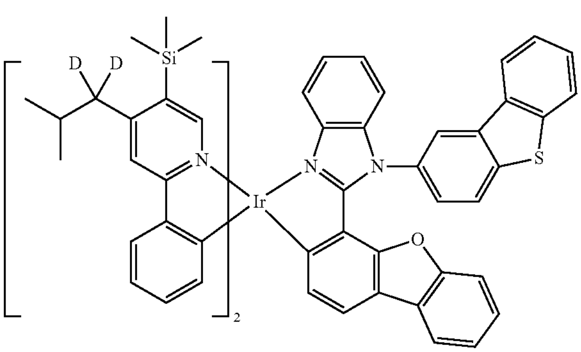
-continued
550
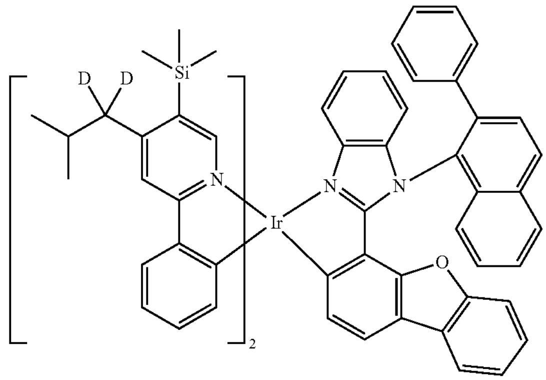
551
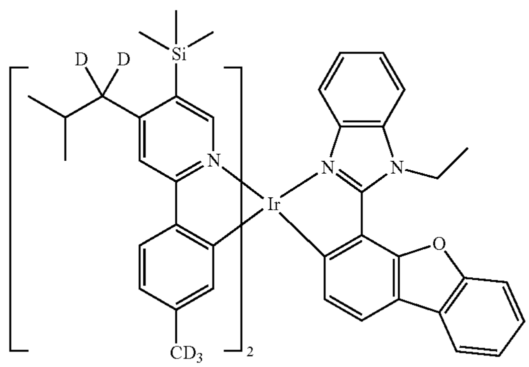
552
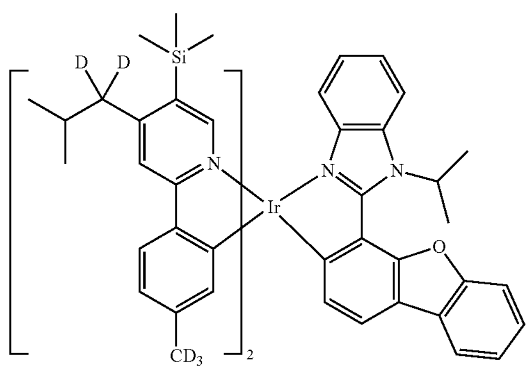
553
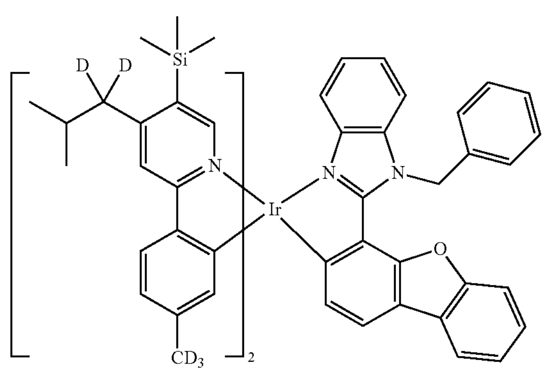

554
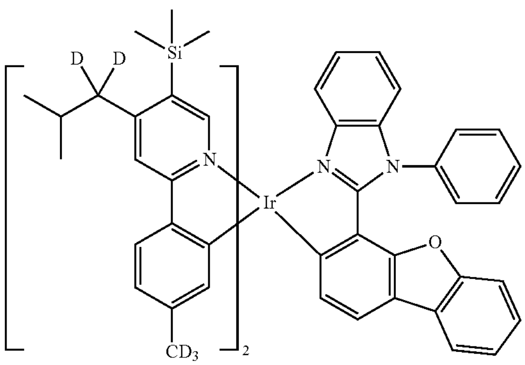
555
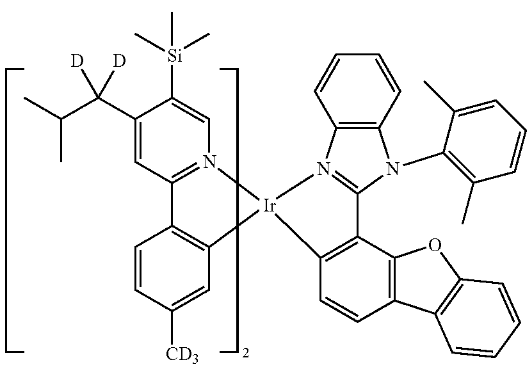
556
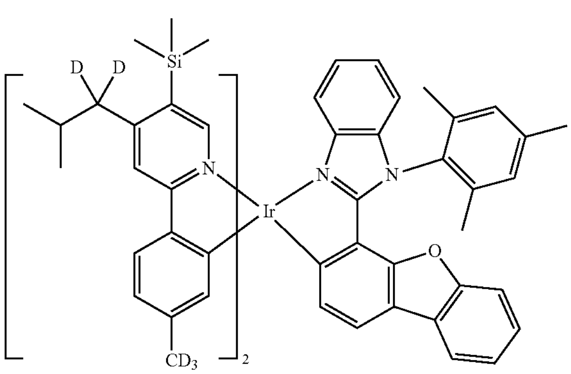
557
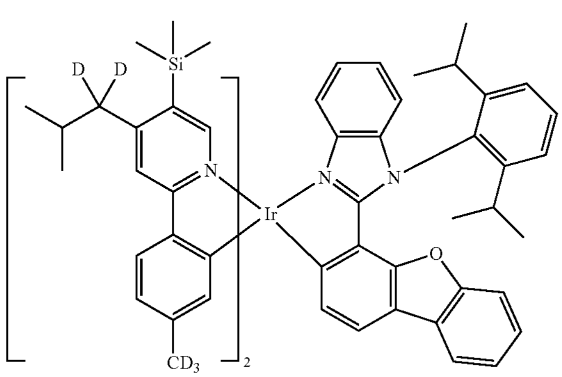
558
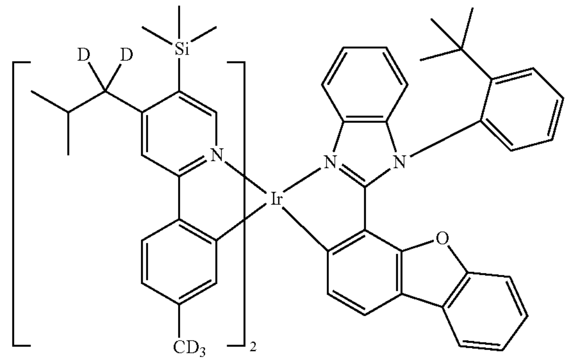
559
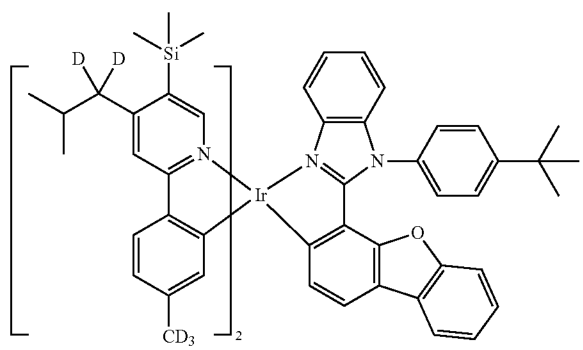
560
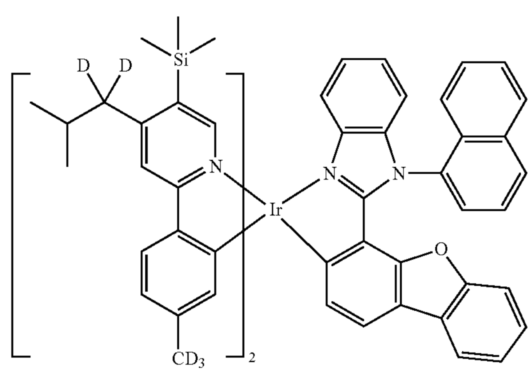
561
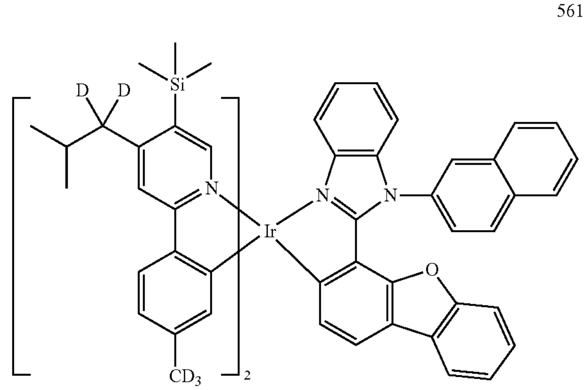

-continued
562
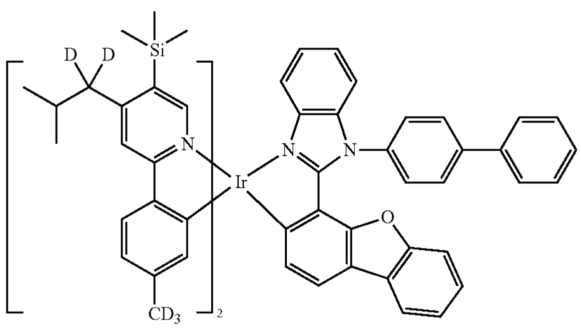
563
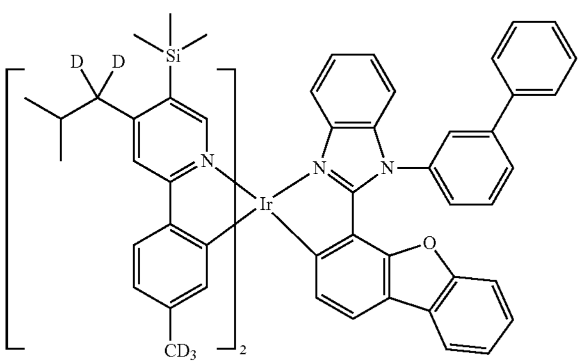
564
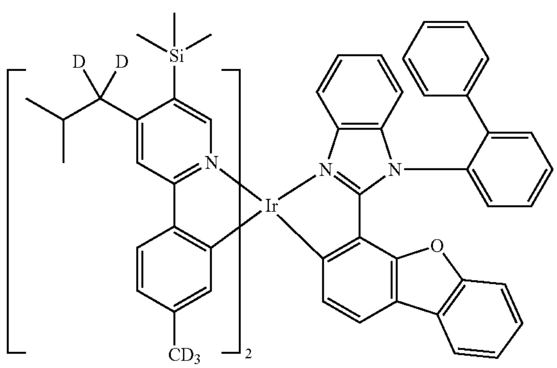
565
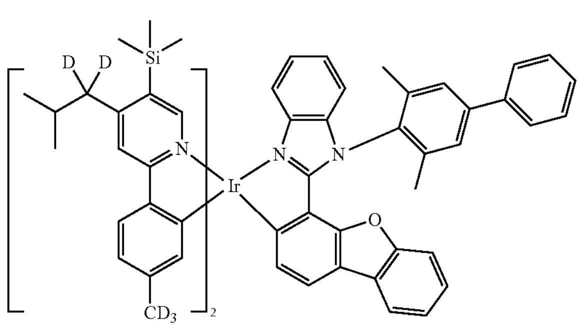
-continued
566
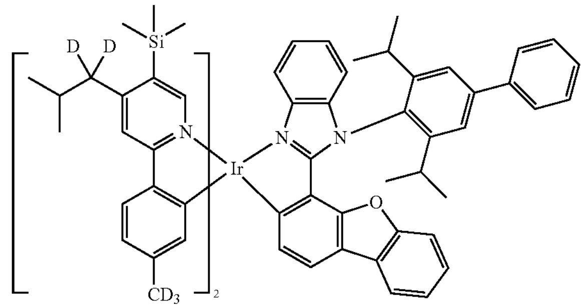
567
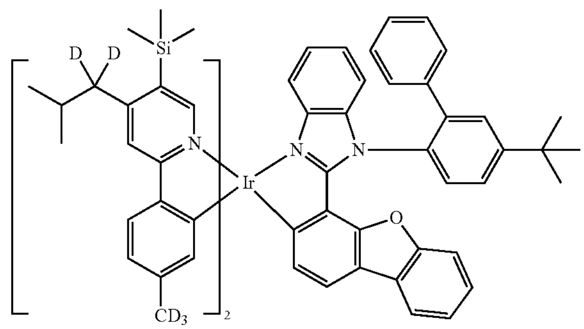
568
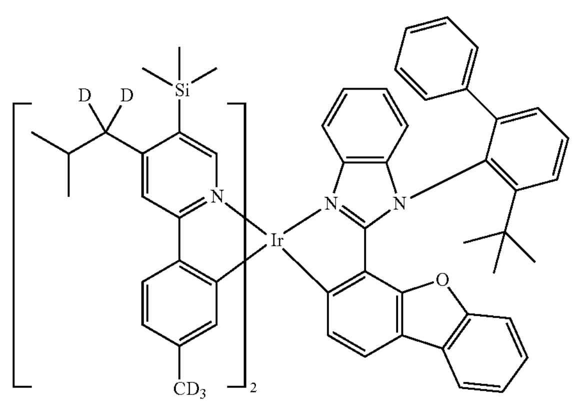
569
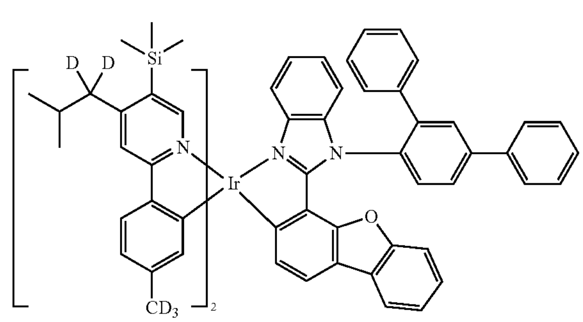

-continued
570
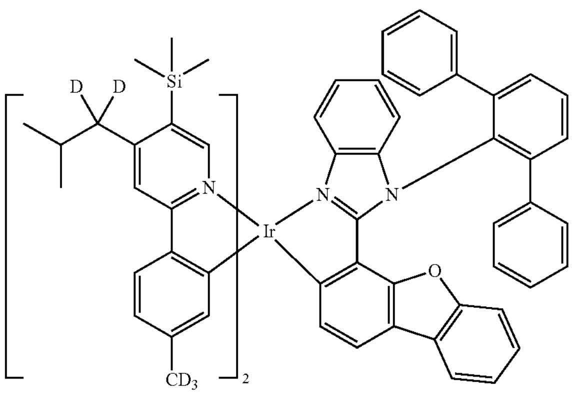
571
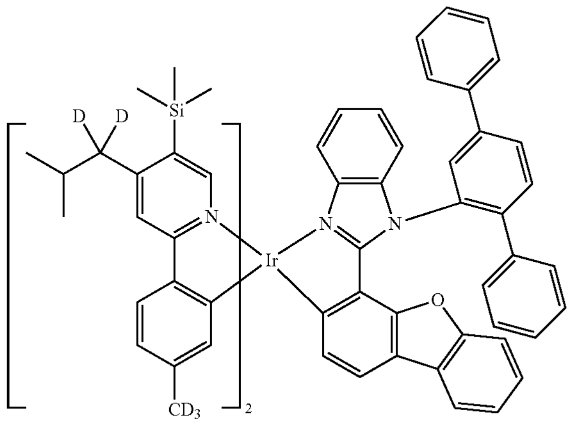
572
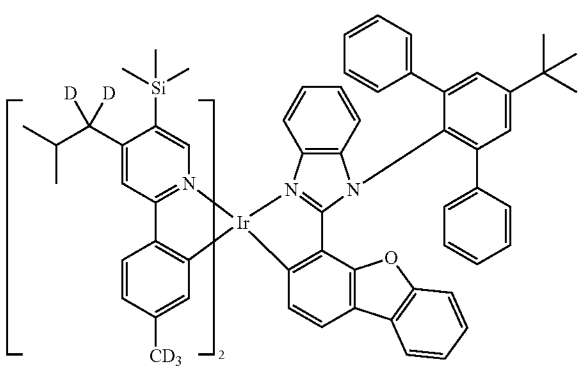
573
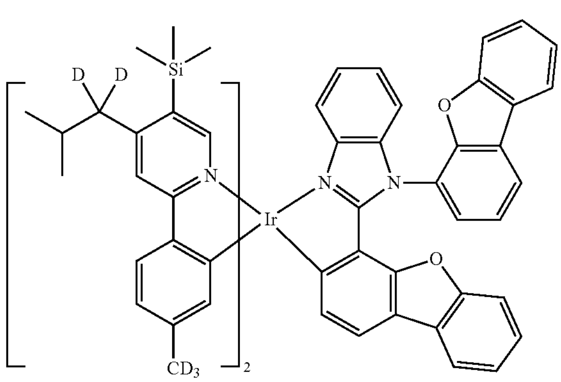
-continued
574
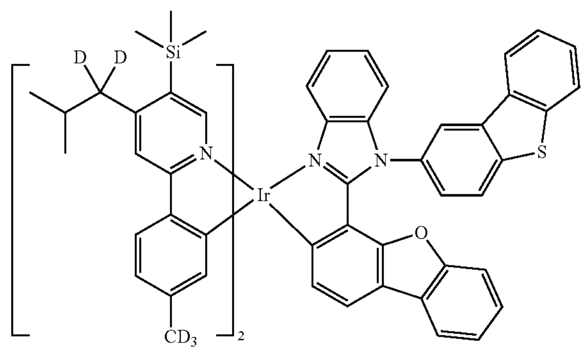
575
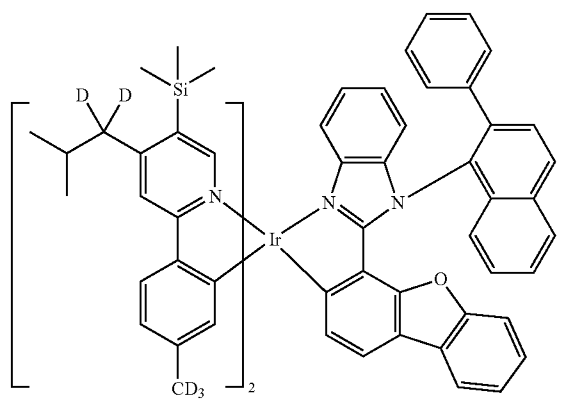
576
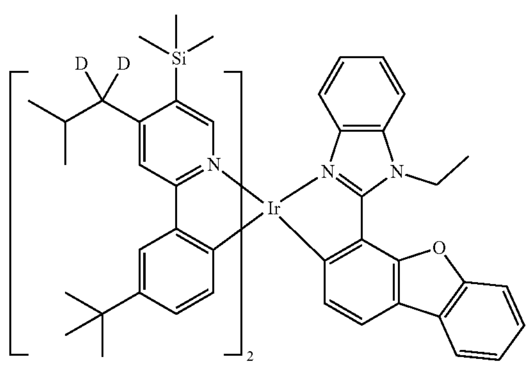
577
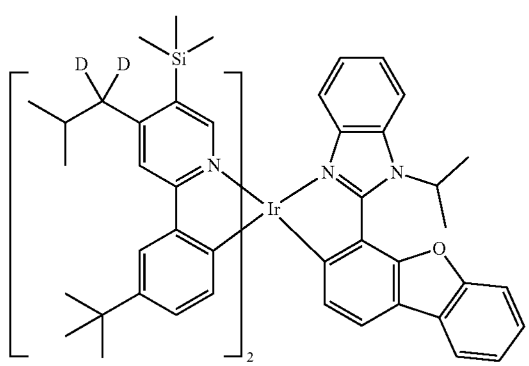

-continued
578
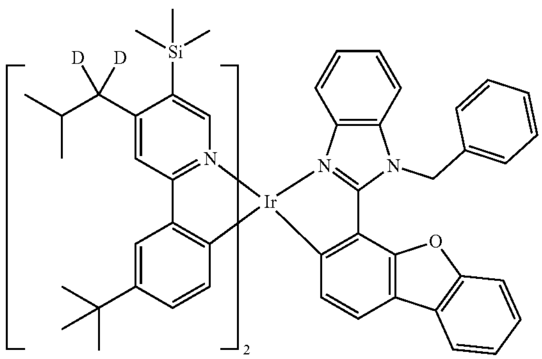
579
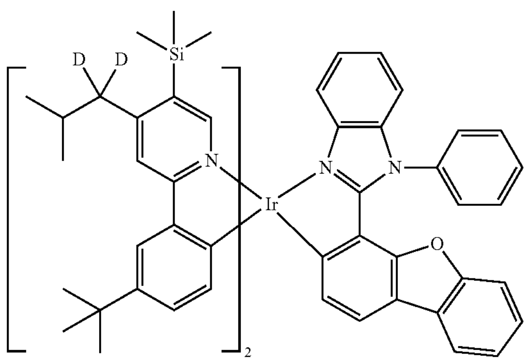
580
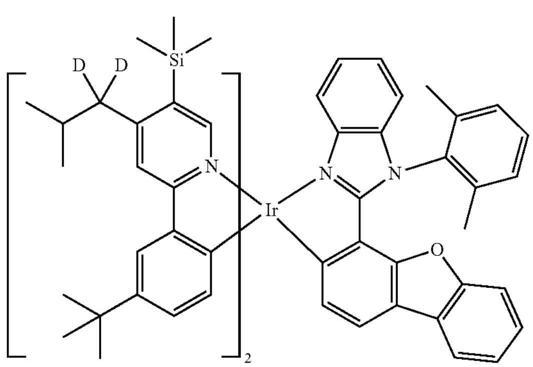
581
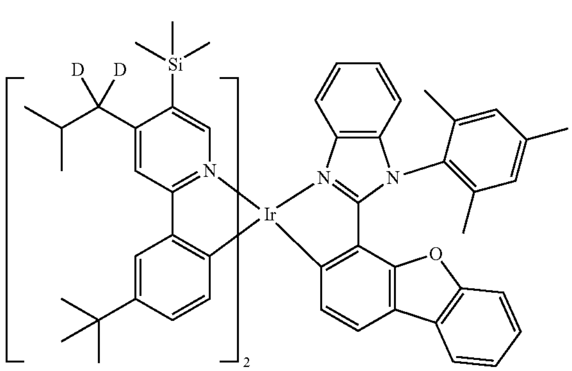
-continued
582
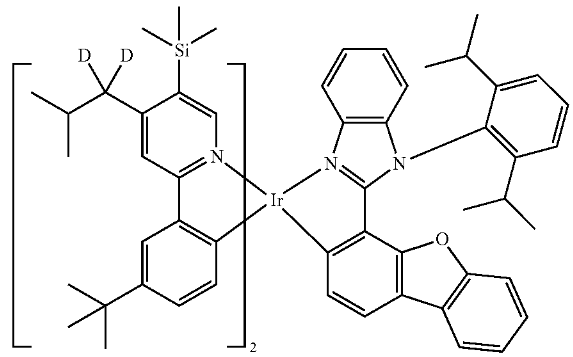
583
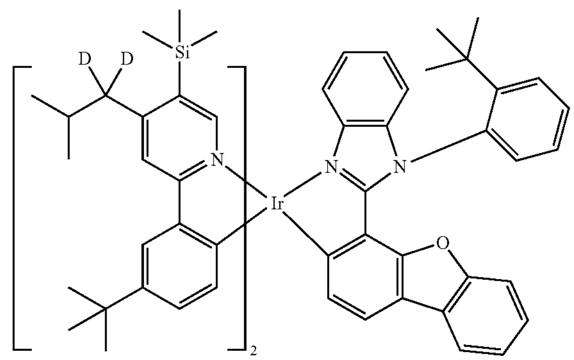
584
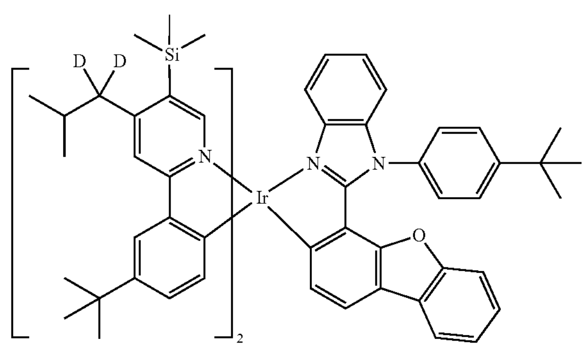
585
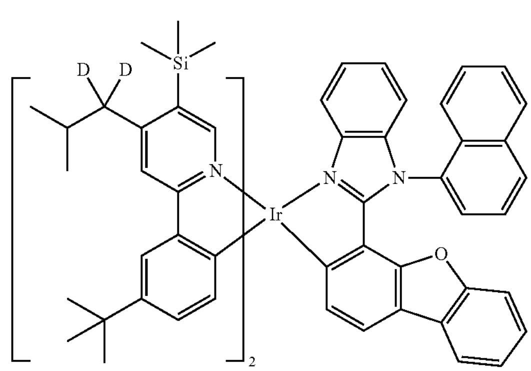

-continued
586
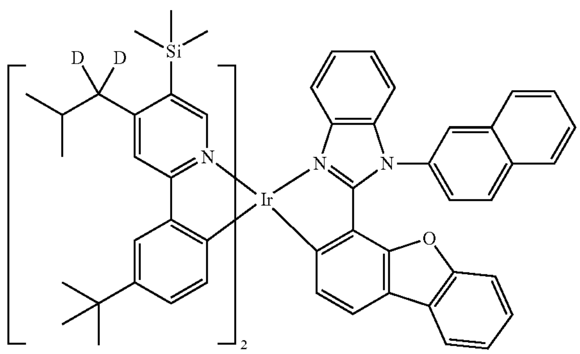
587
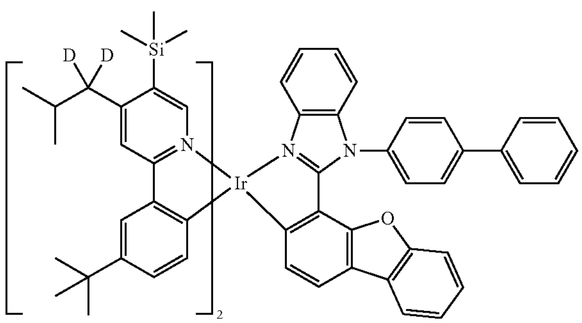
588
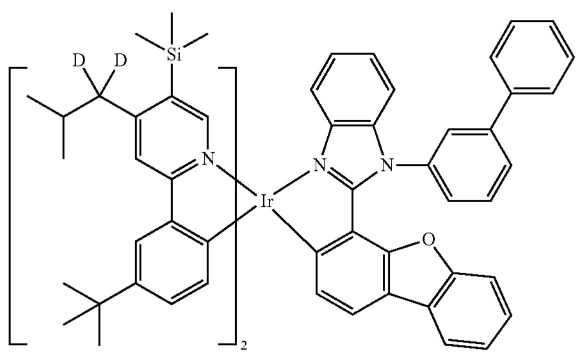
589
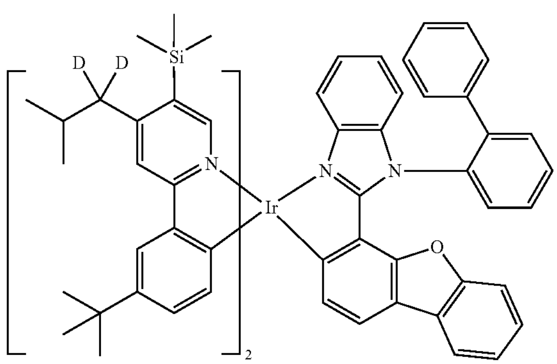
-continued
590
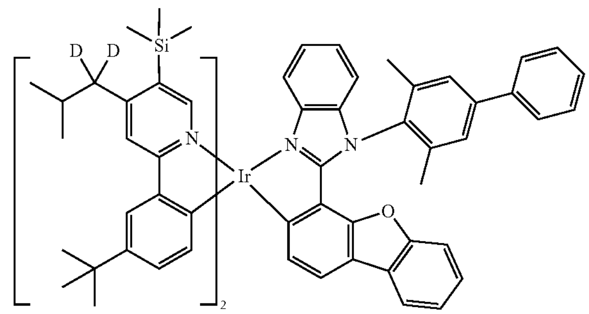
591
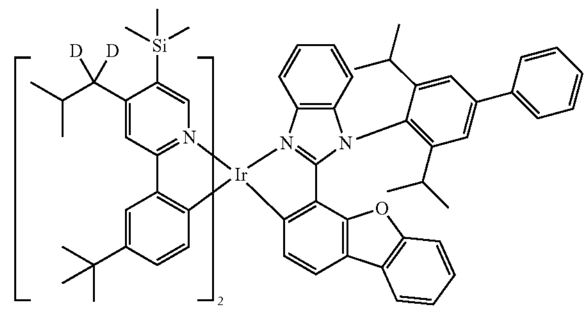
592
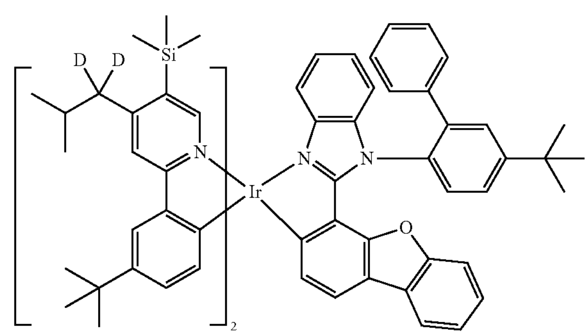
593
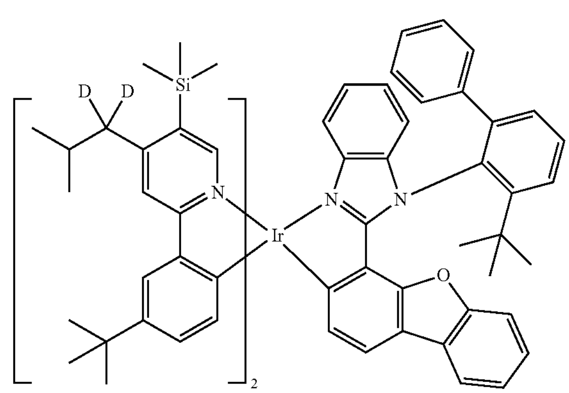

-continued
594
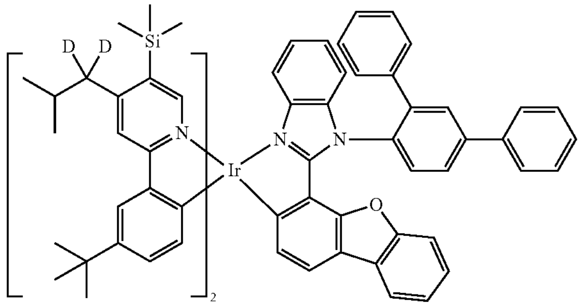
595
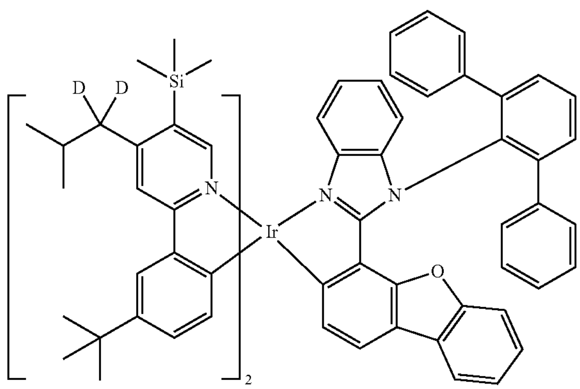
596
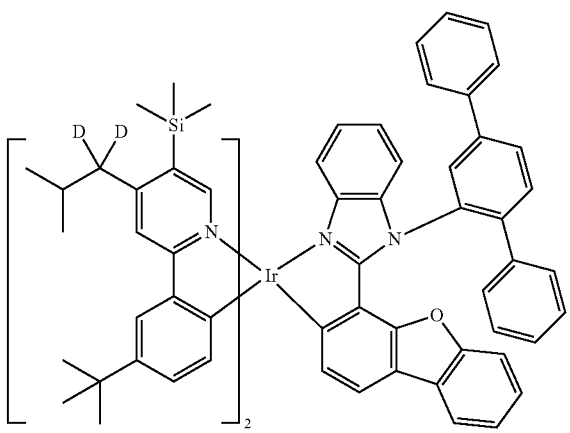
597
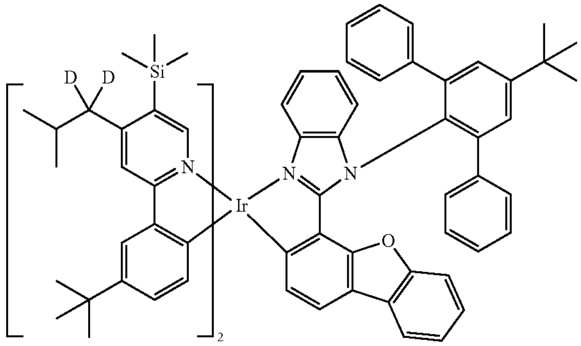
-continued
598
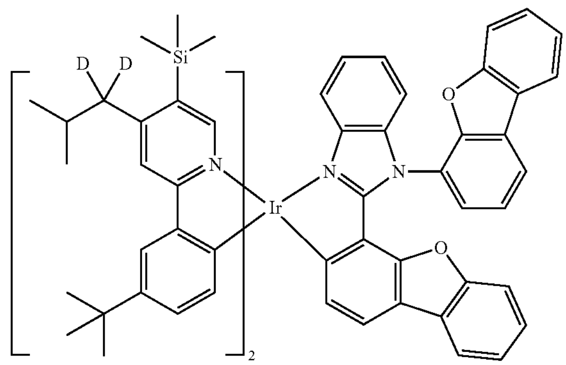
599
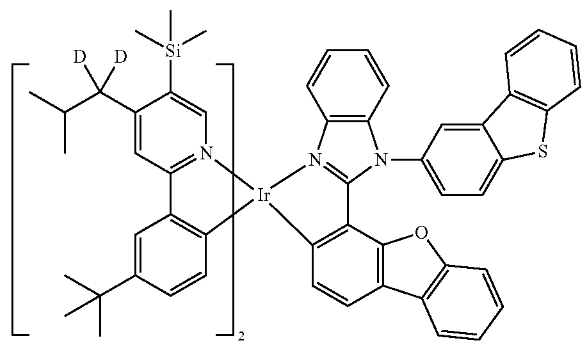
600
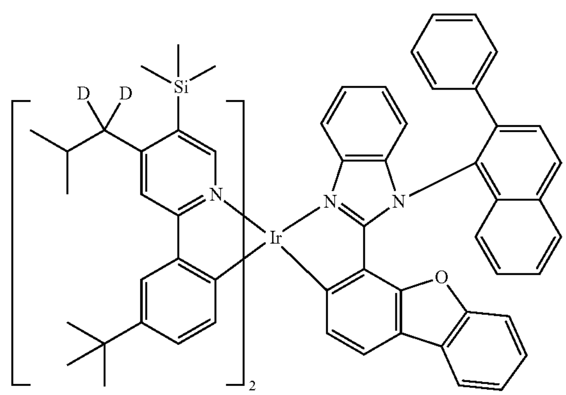
601
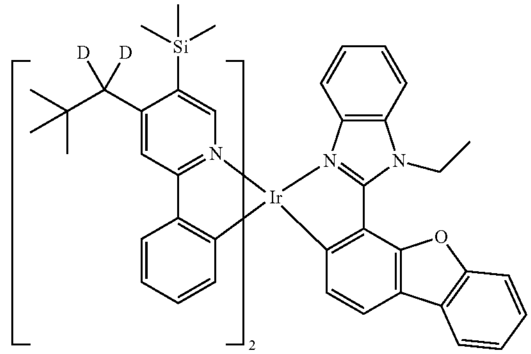

-continued
602
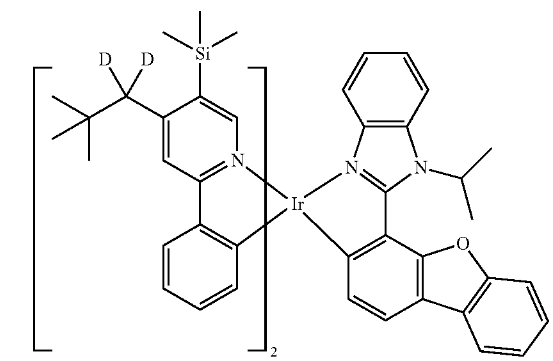
603
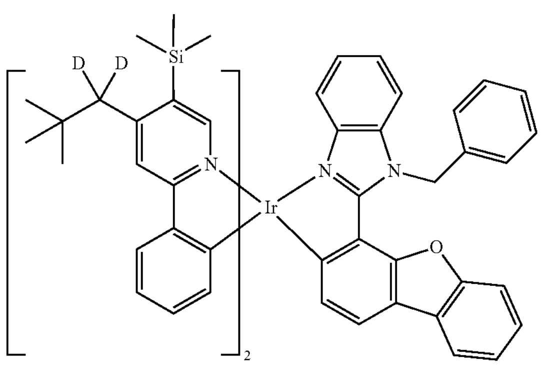
604
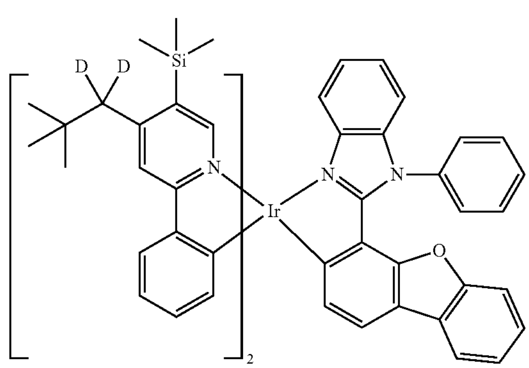
605
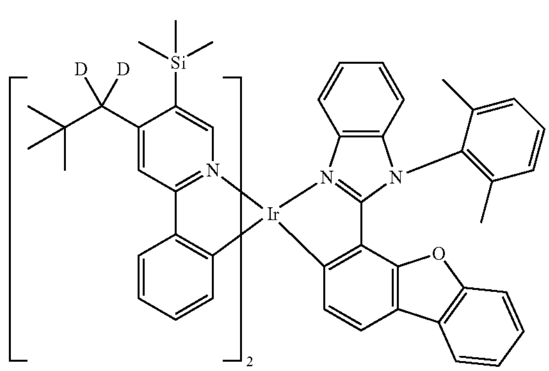
-continued
606
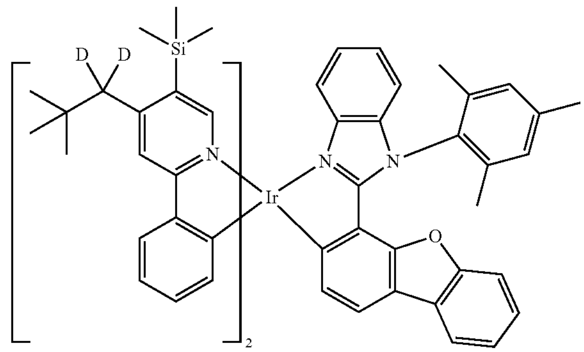
607
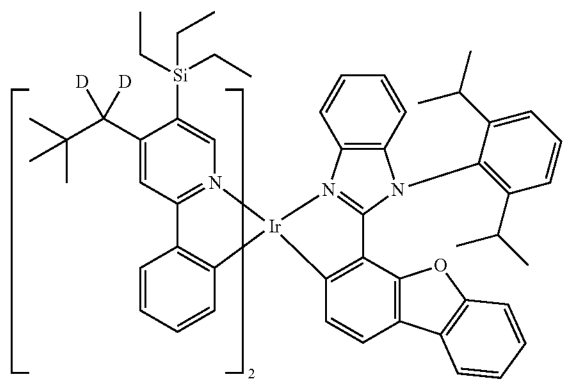
608
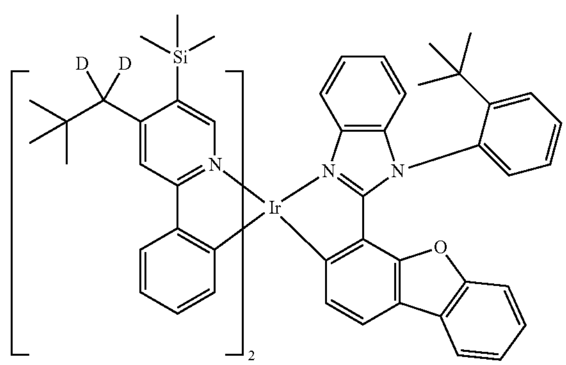
609
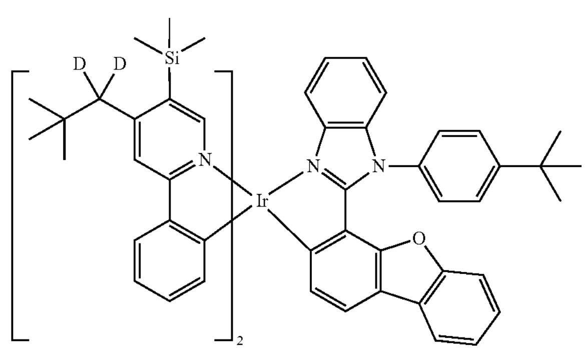

-continued
610
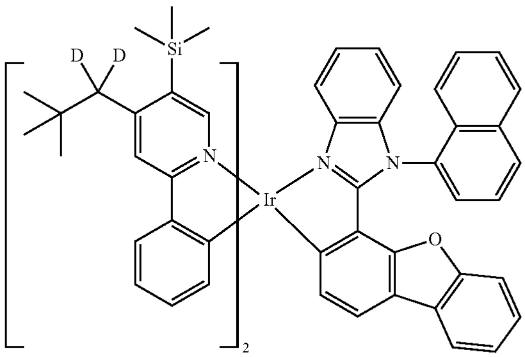
611
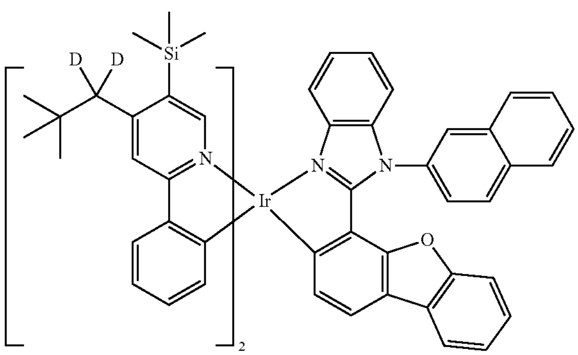
612
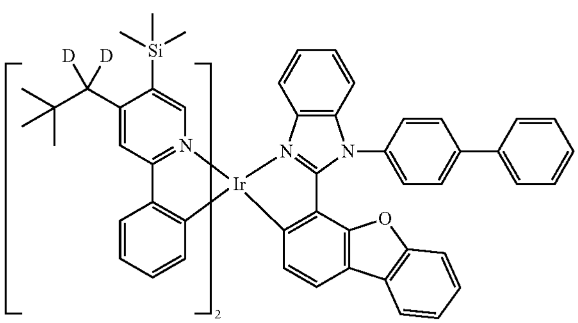
613
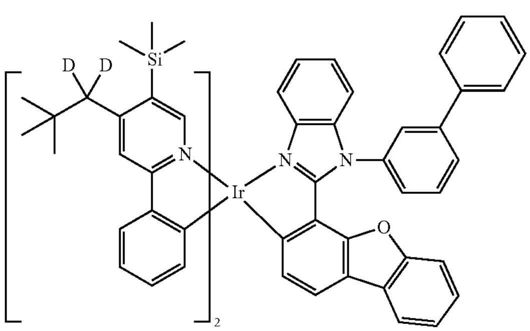
-continued
614
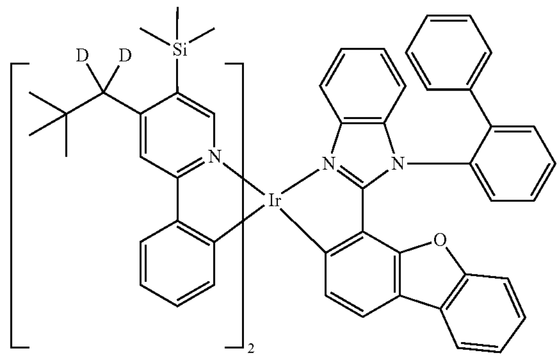
615
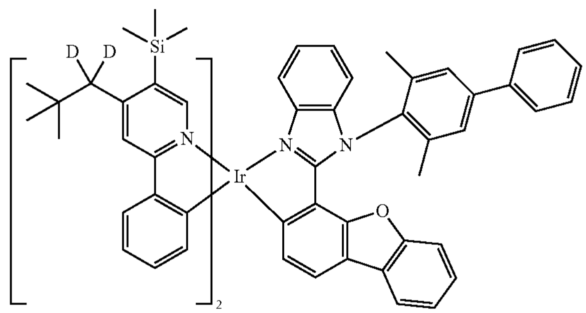
616
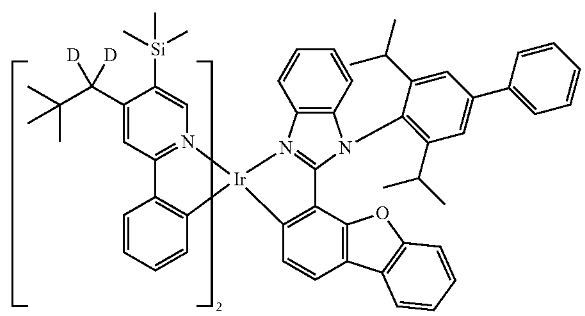
617
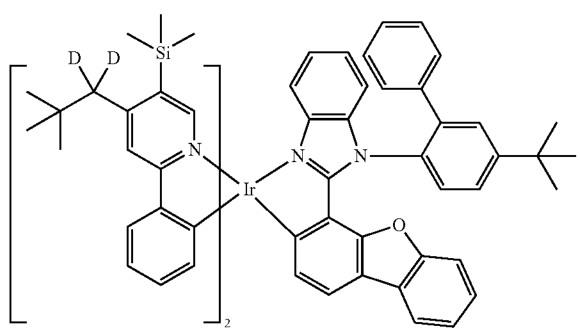

-continued
618
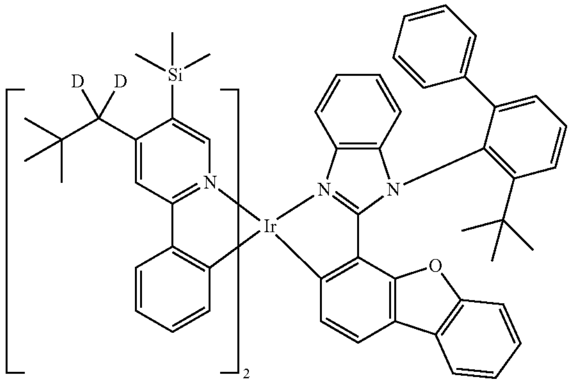
619
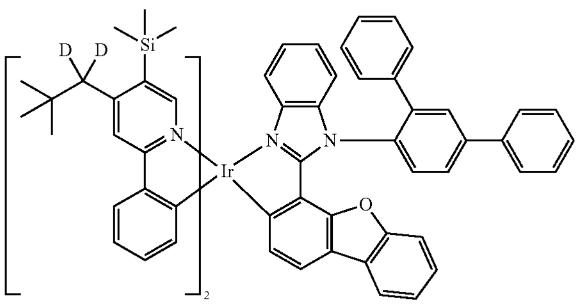
620
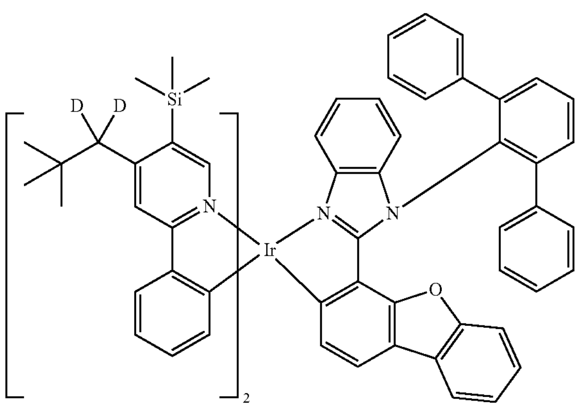
621
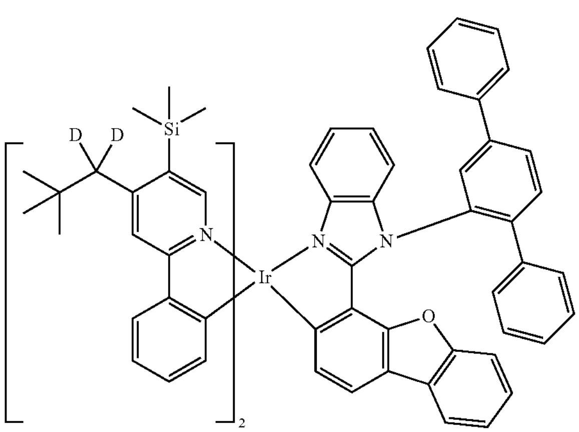
-continued
622
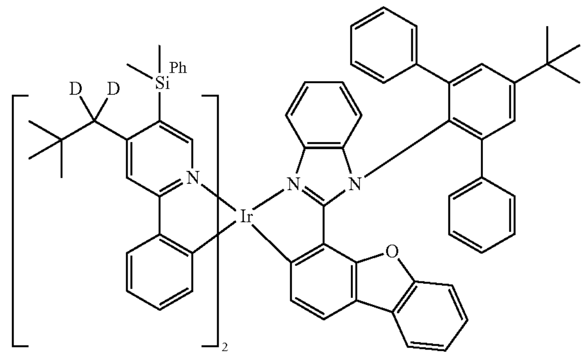
623
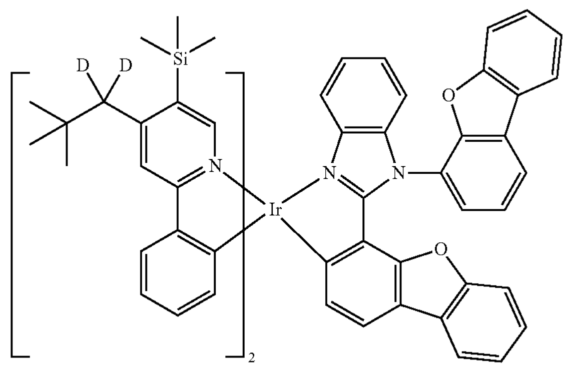
624
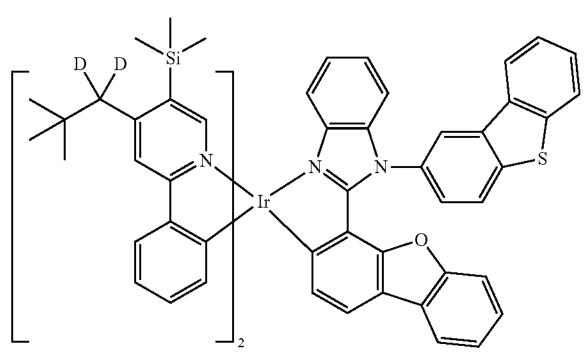
625
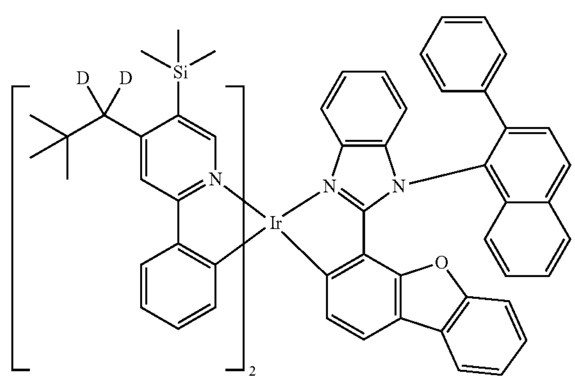

-continued
626
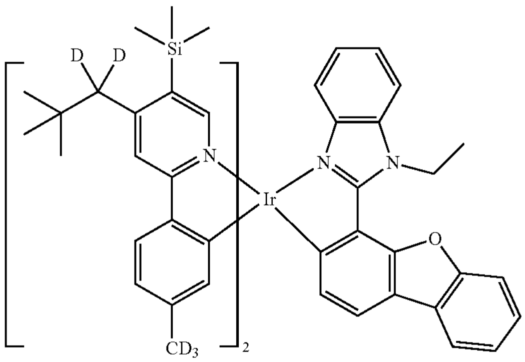
627
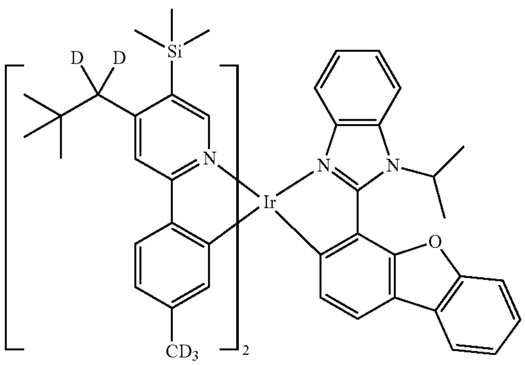
628
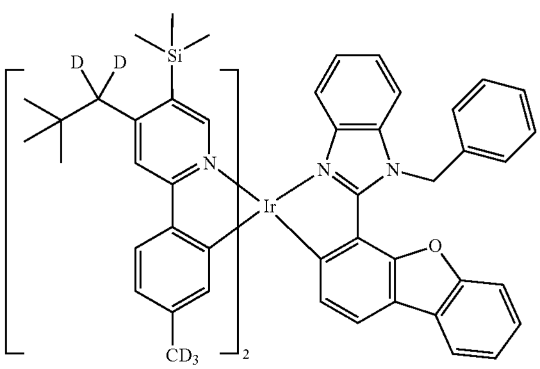
629
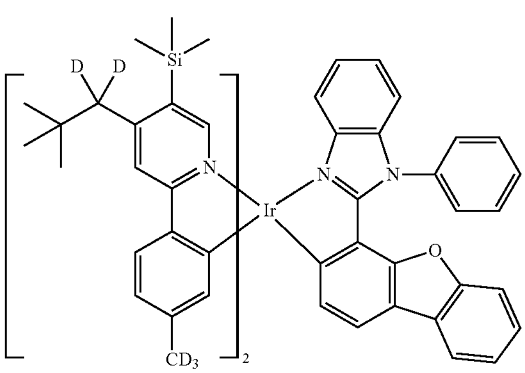
-continued
630
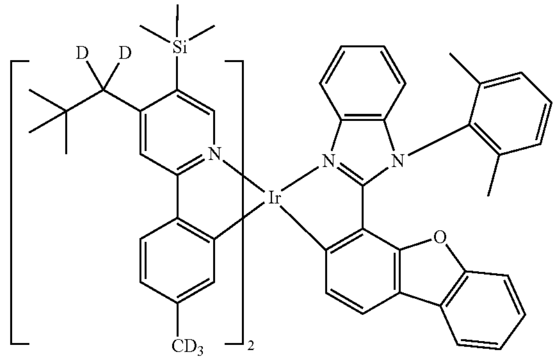
631
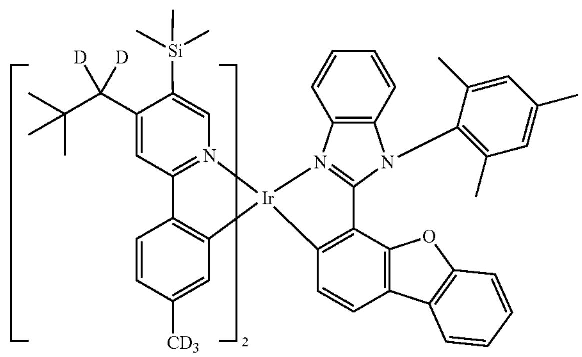
632
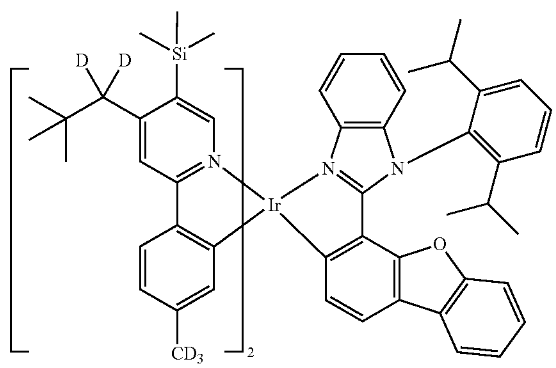
633
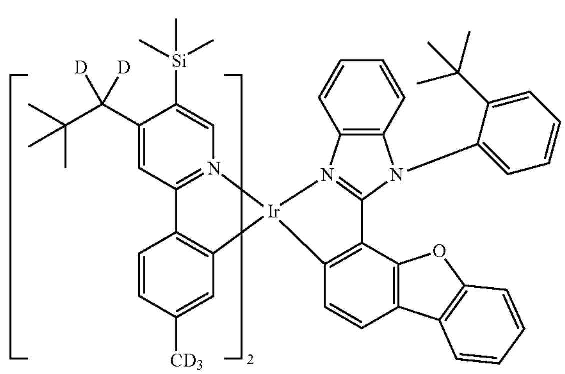

-continued
634
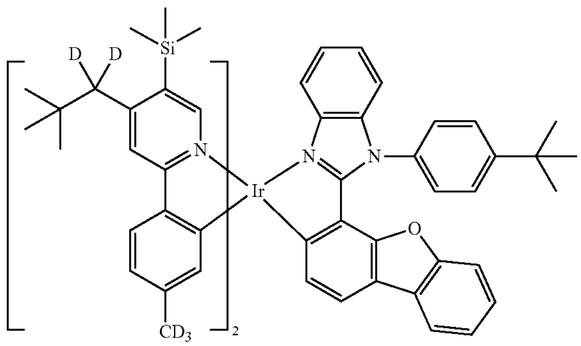
635
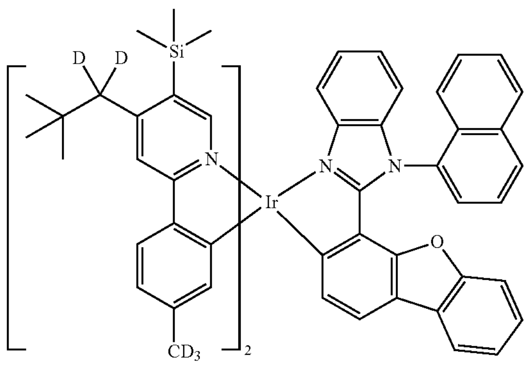
636
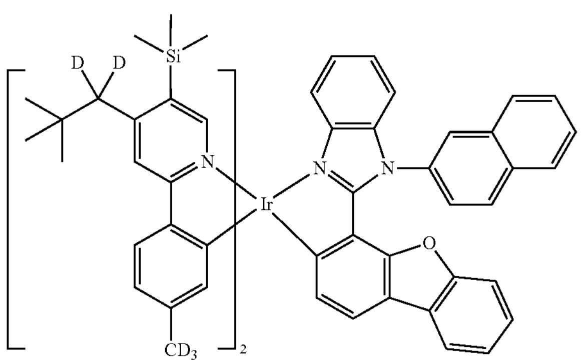
637
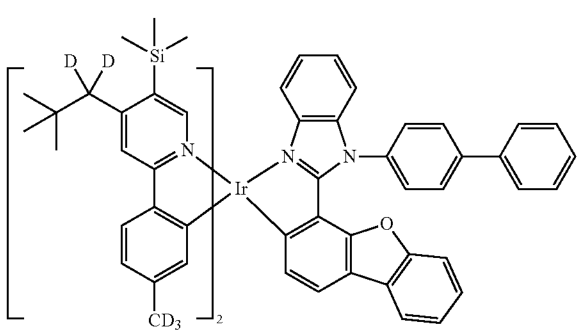
-continued
638
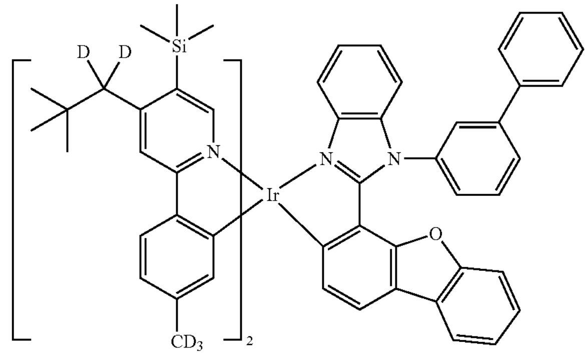
639
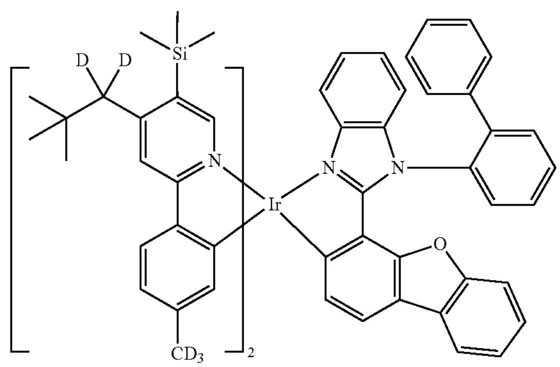
640
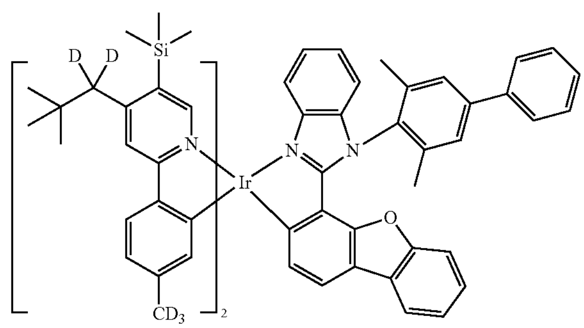
641
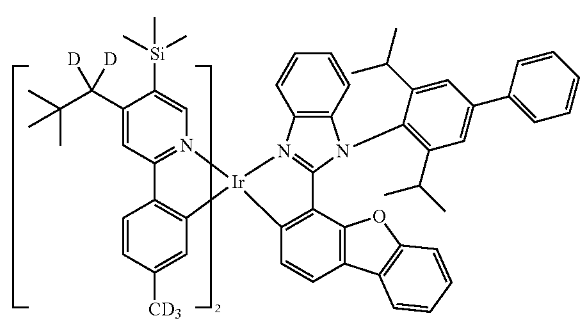

-continued
642
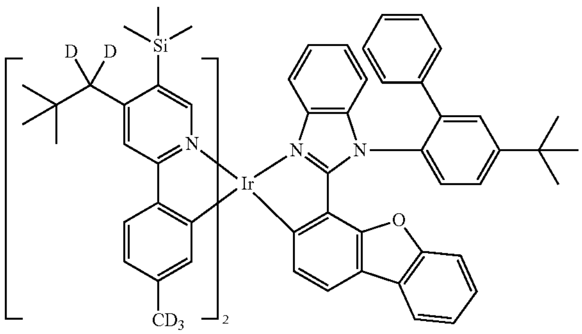
643
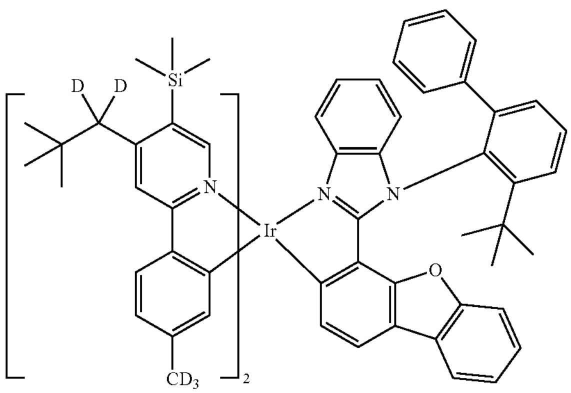
644
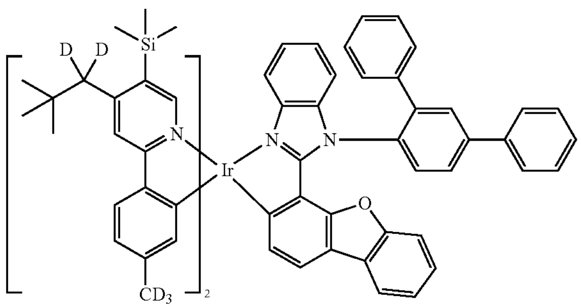
645
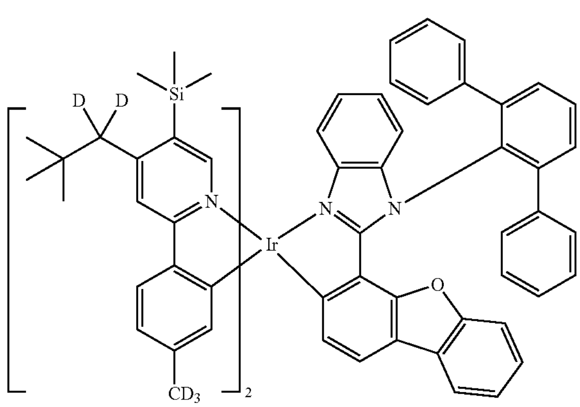
-continued
646
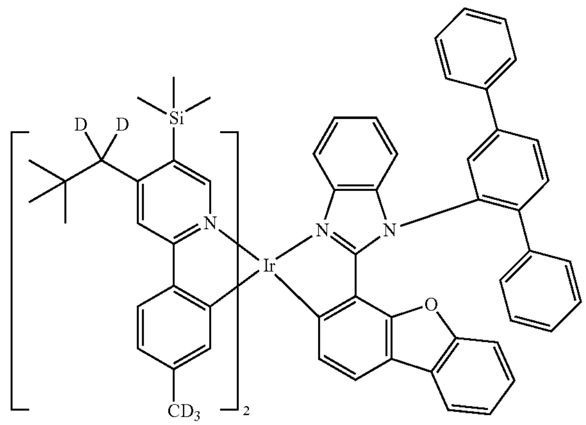
647
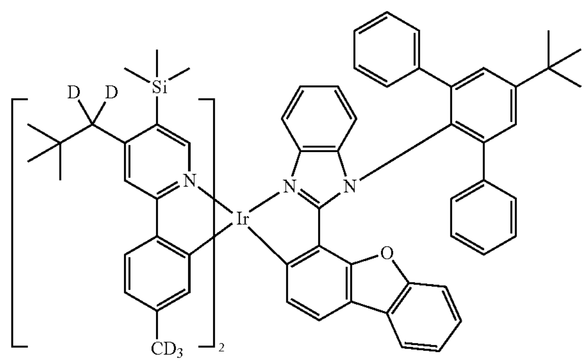
648
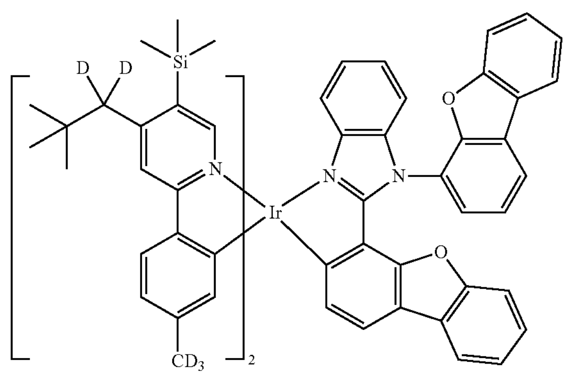
649
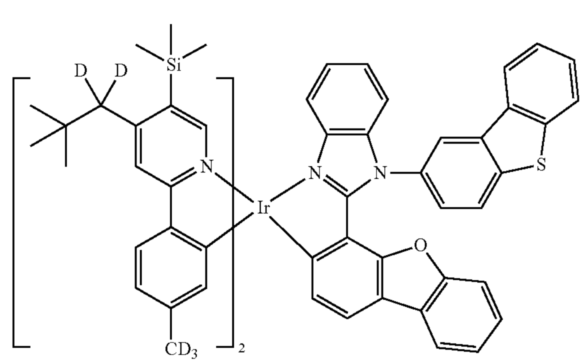

-continued
650
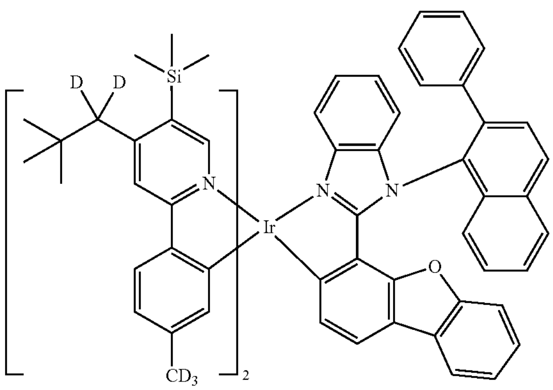
651
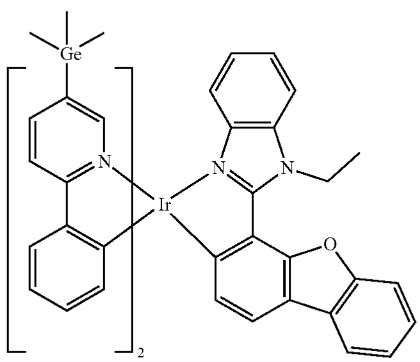
652
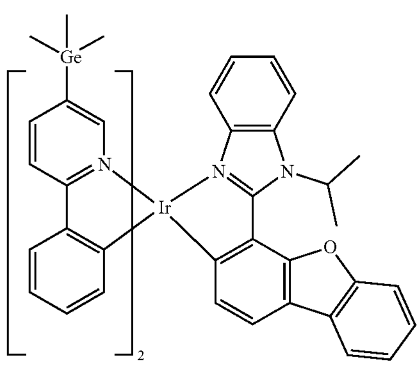
653
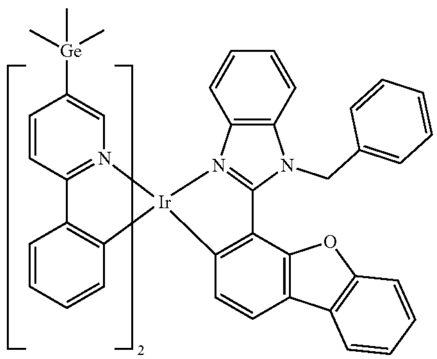
-continued
654
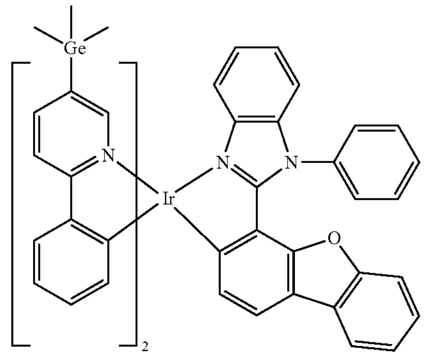
655
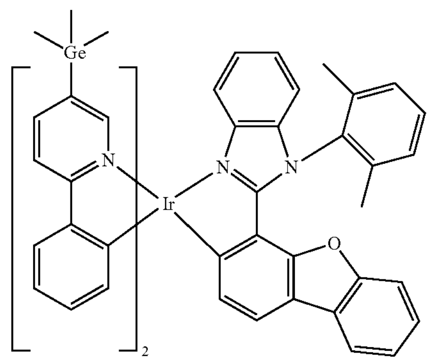
656
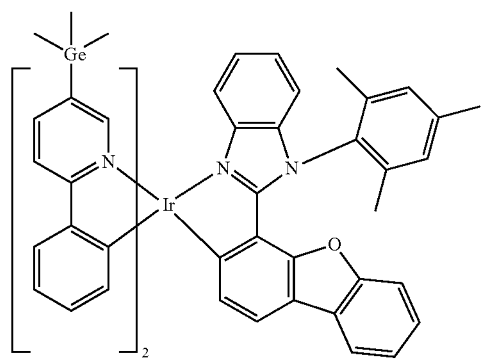
657
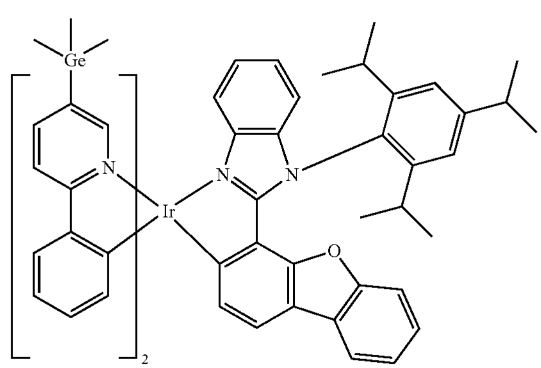

658
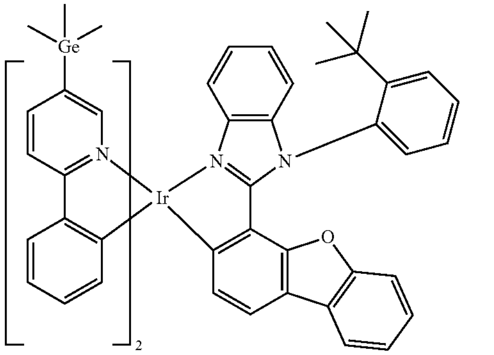
659
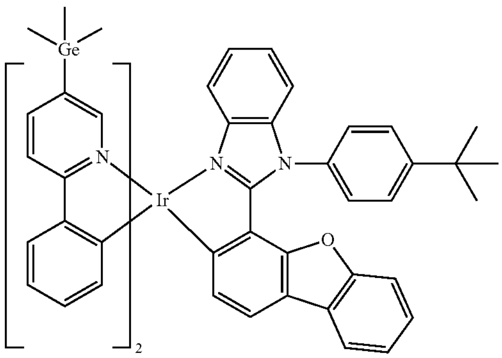
660
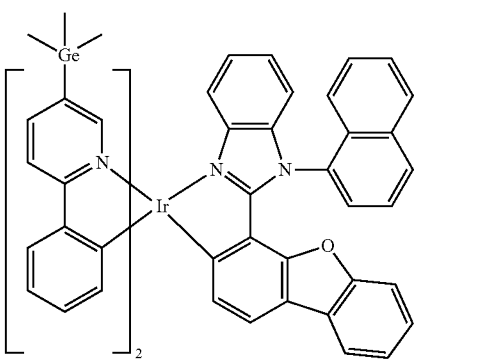
661
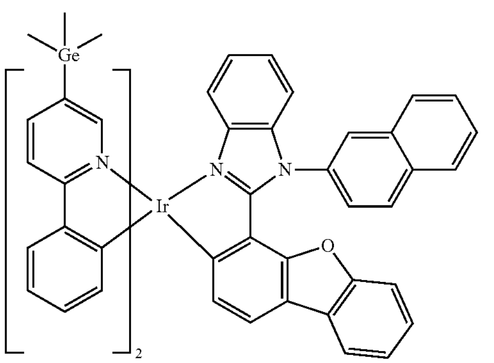
662
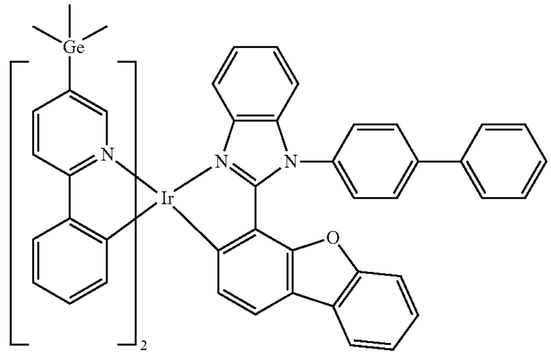
663
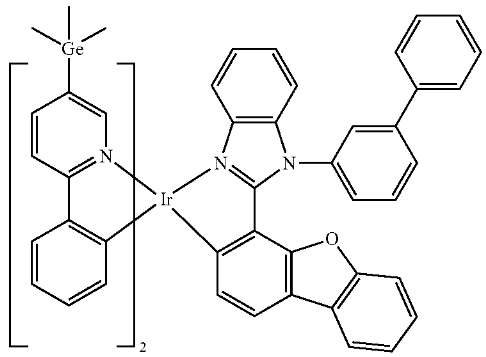
664
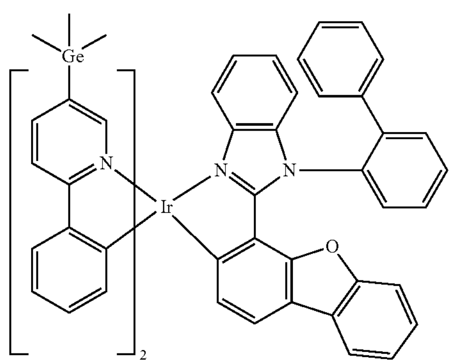
665
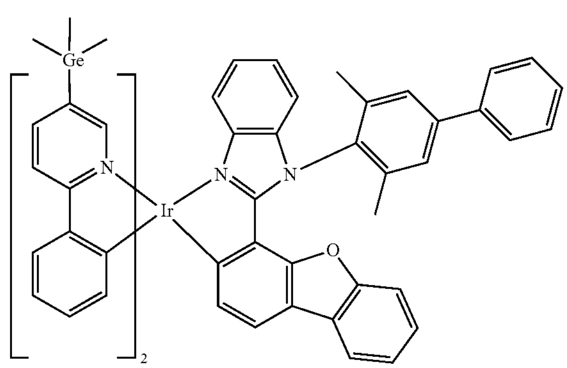

-continued
666
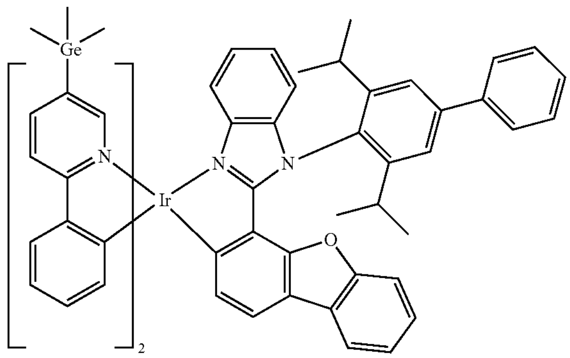
667
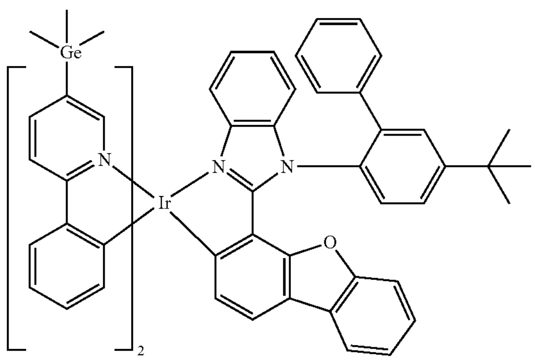
668
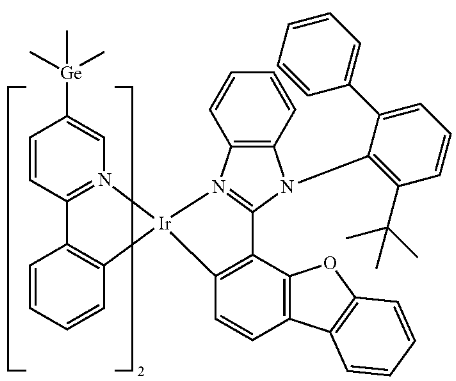
669
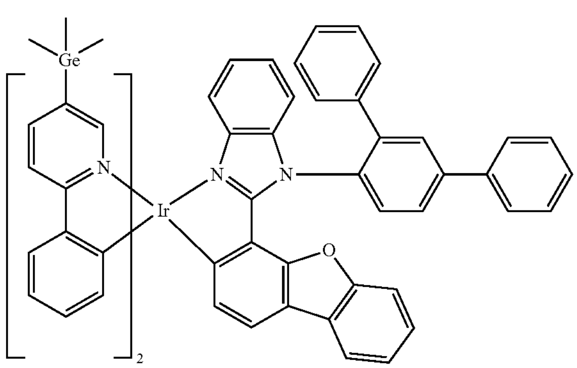
-continued
670
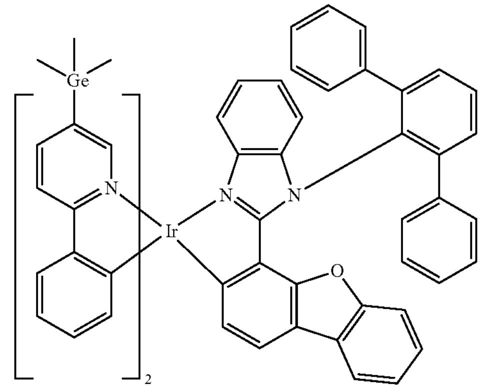
671
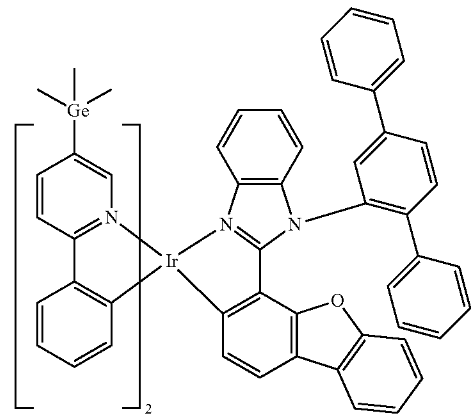
672
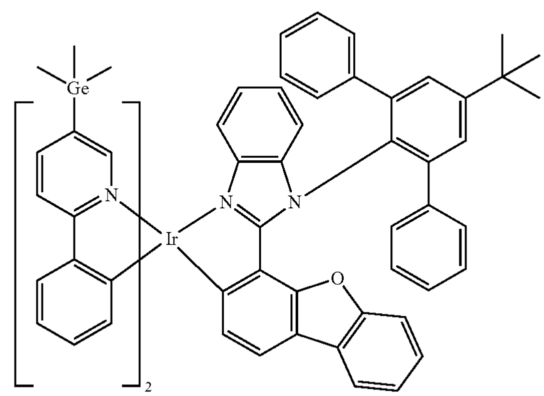
673
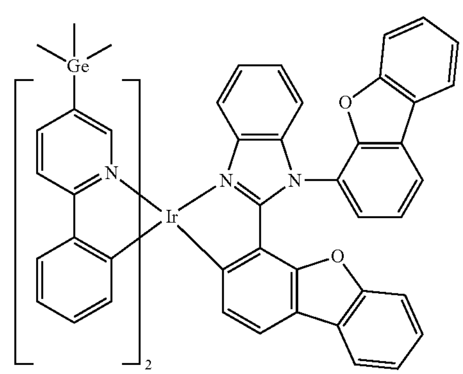

674
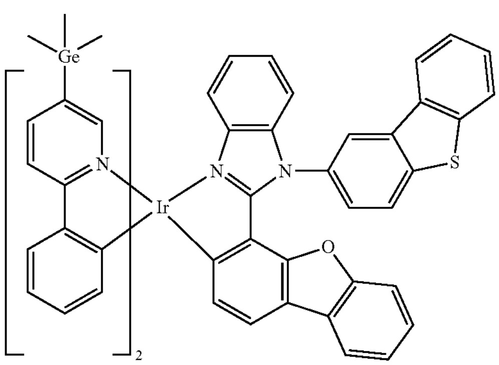
675
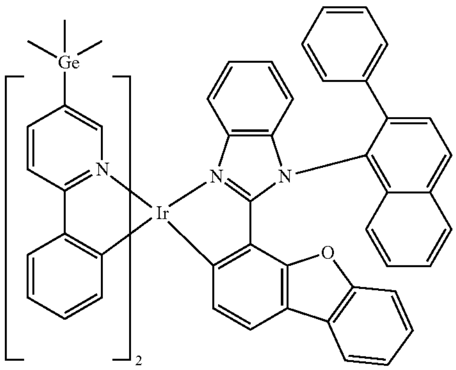
676
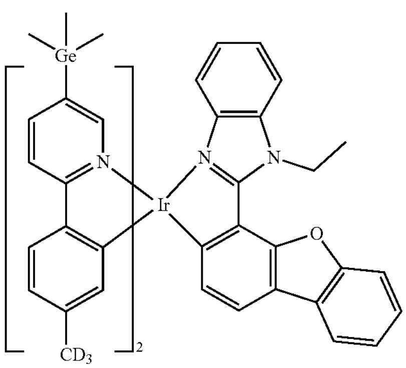
677
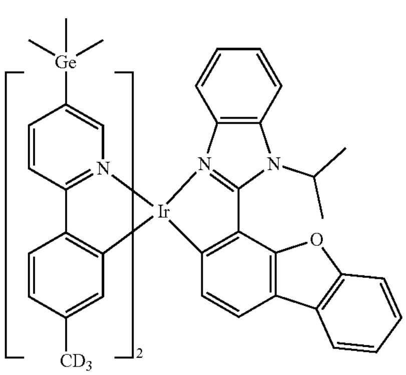
678
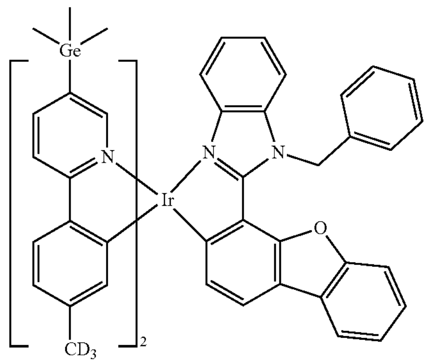
679
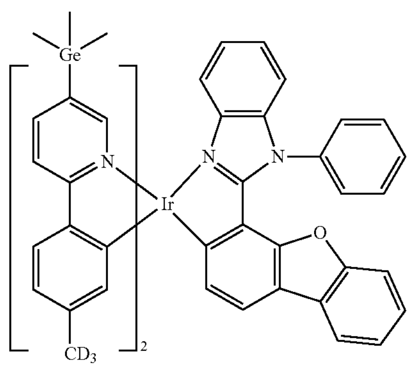
680
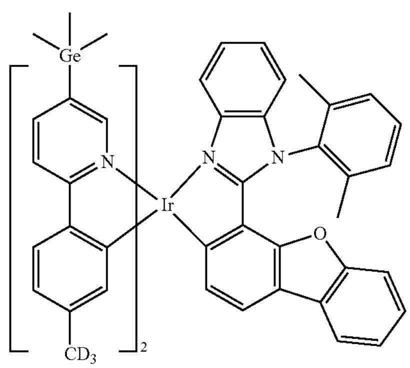
681
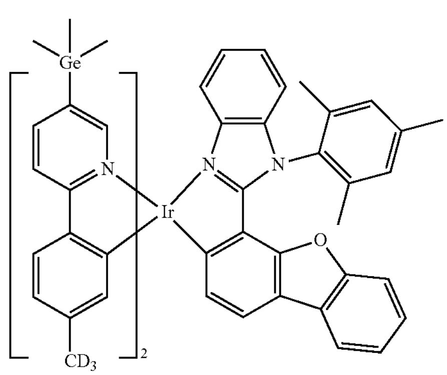

-continued
682
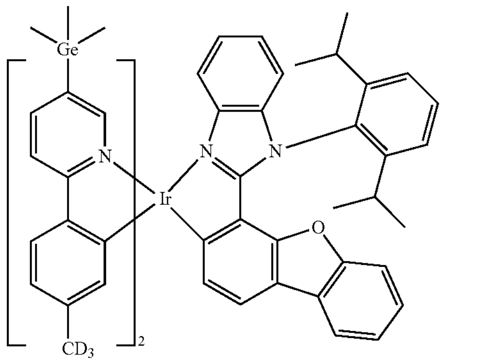
683
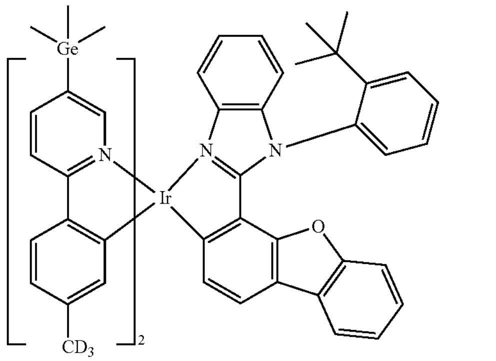
684
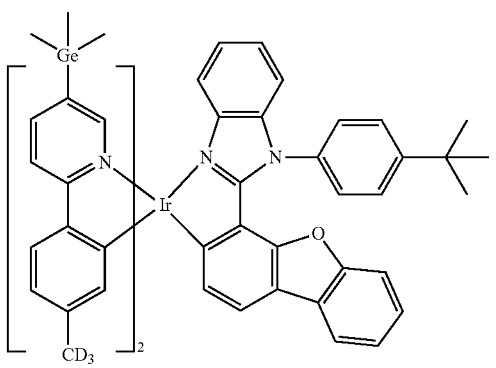
685
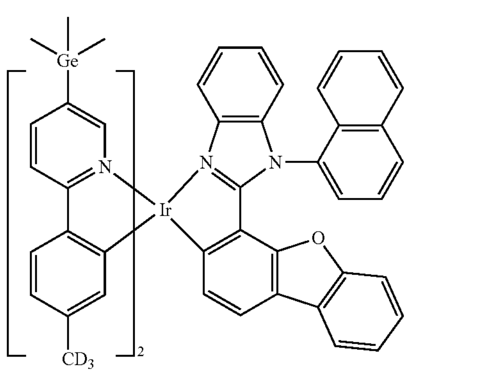
-continued
686
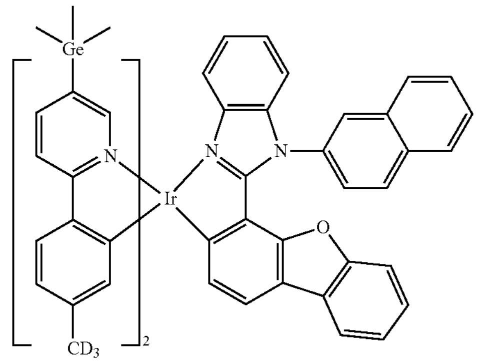
687
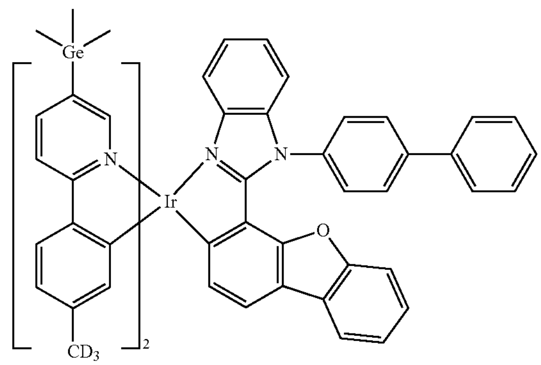
688
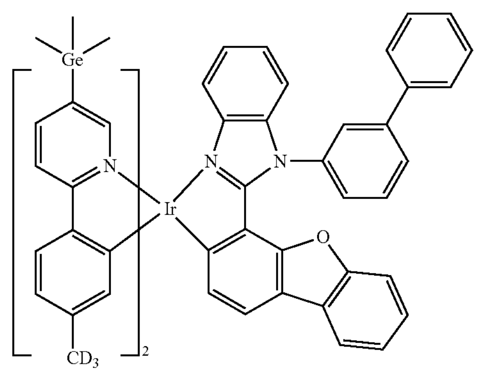
689
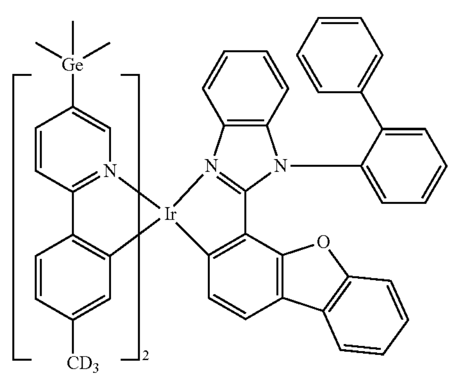

-continued
690
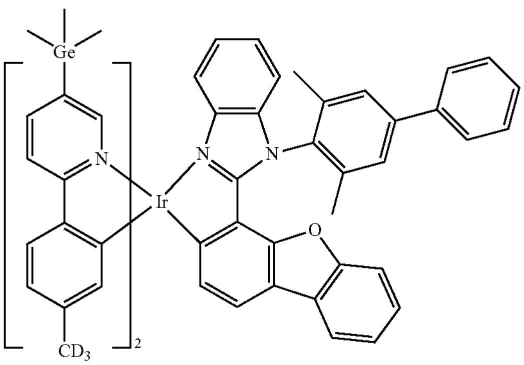
691
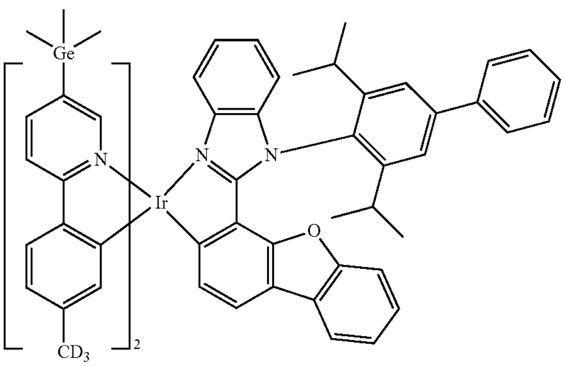
692
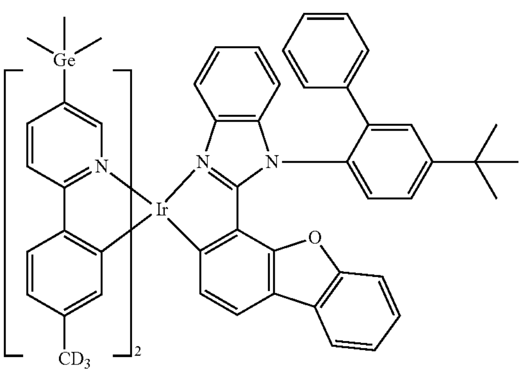
693
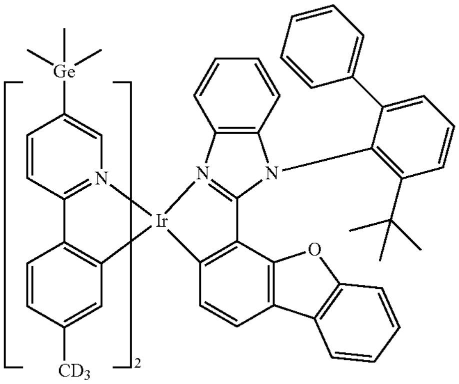
-continued
694
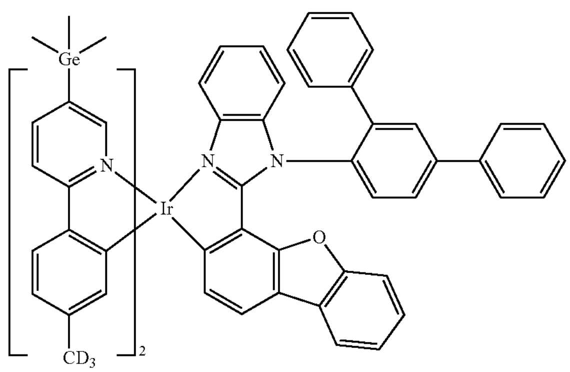
695
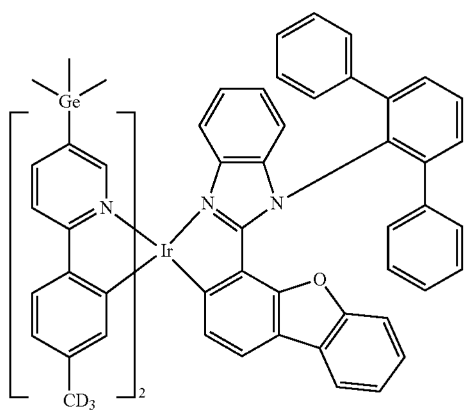
696
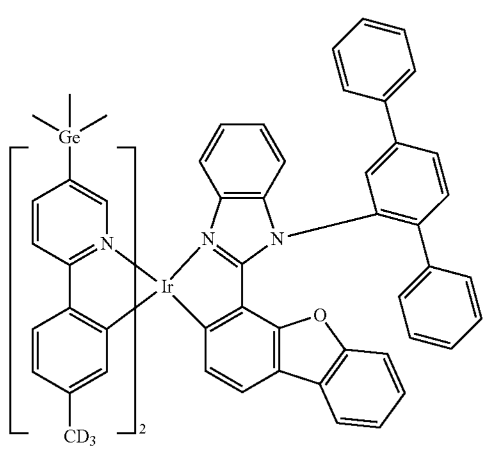

-continued
697
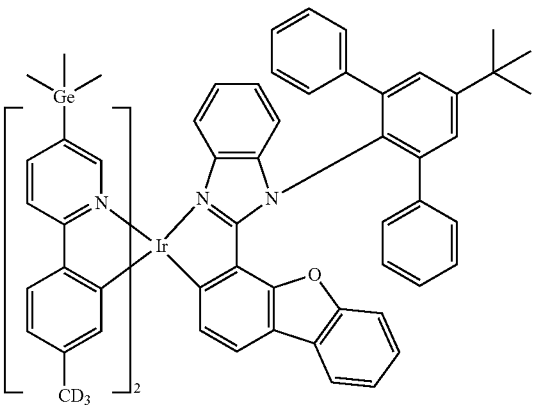
698
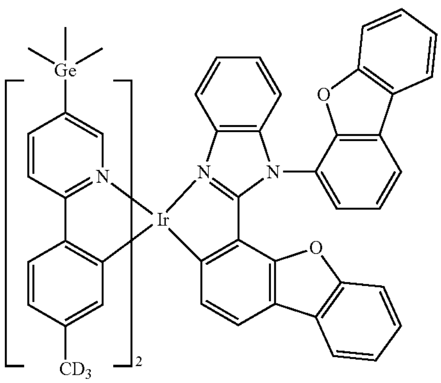
699
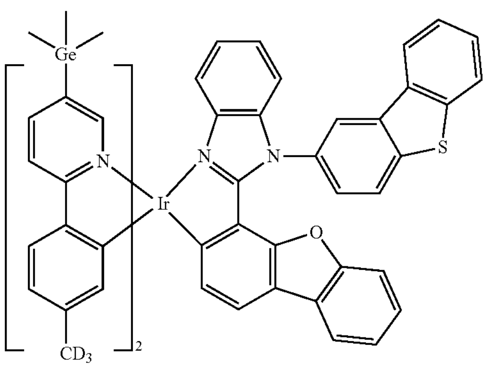
700
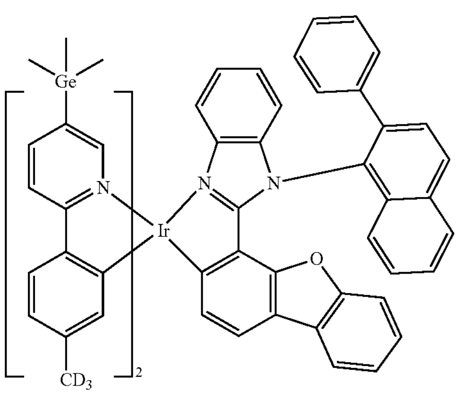
-continued
701
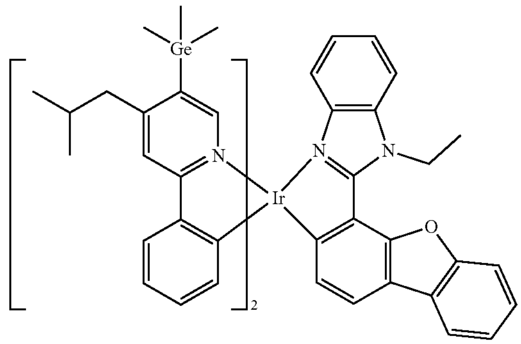
702
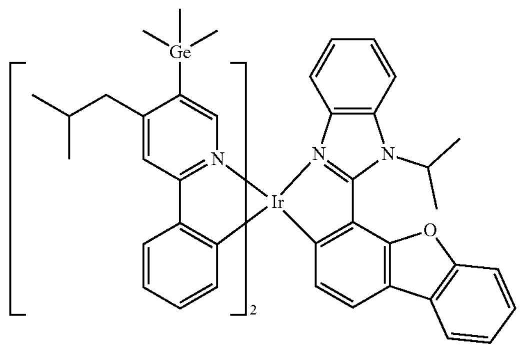
703
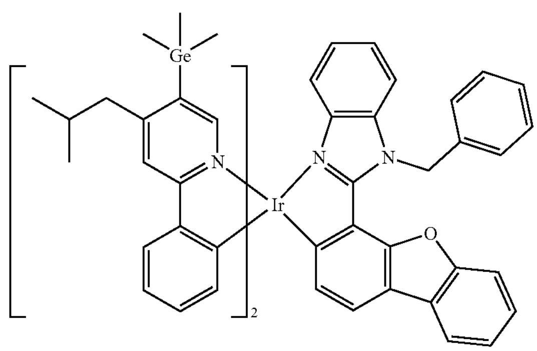
704
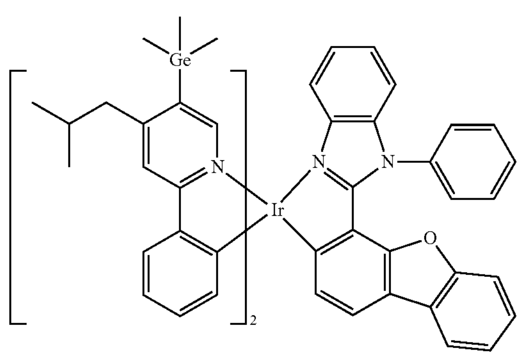

-continued
705
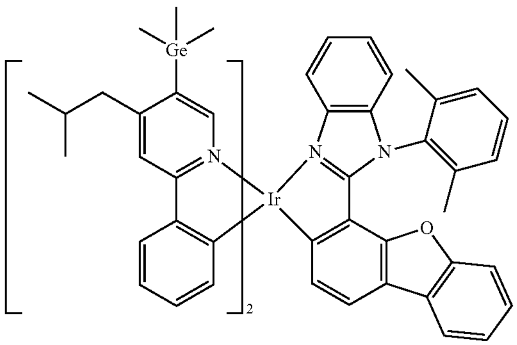
706
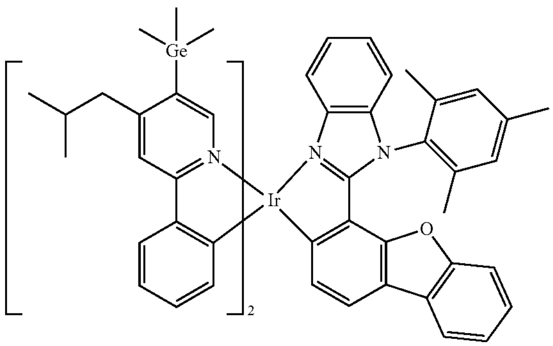
707
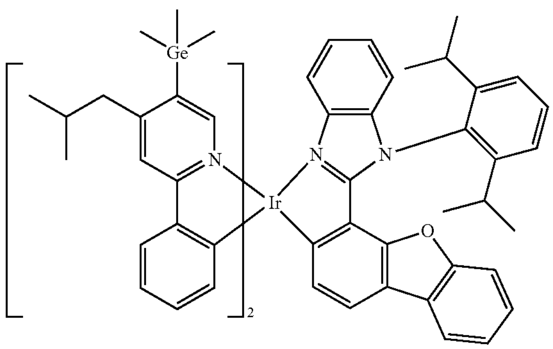
708
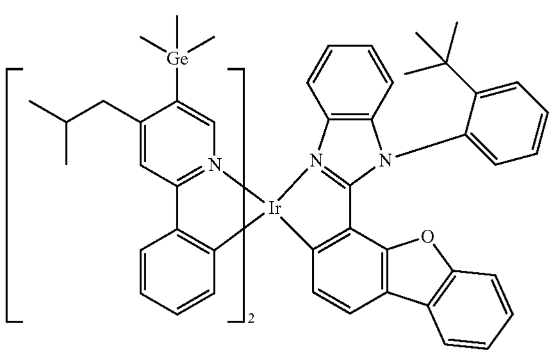
-continued
709
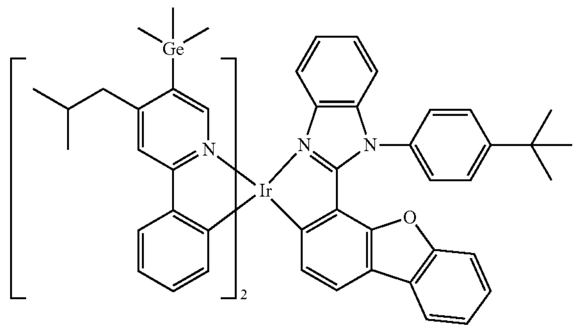
710
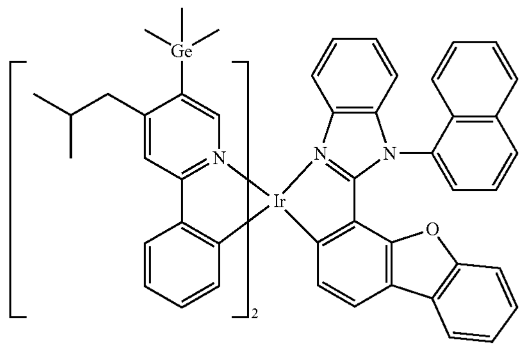
711
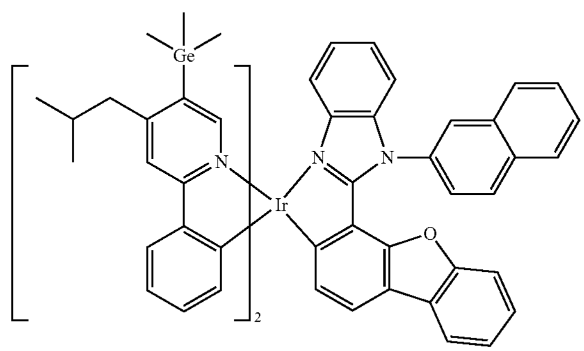
712
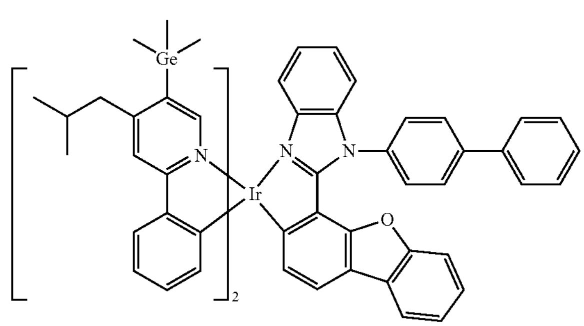

713
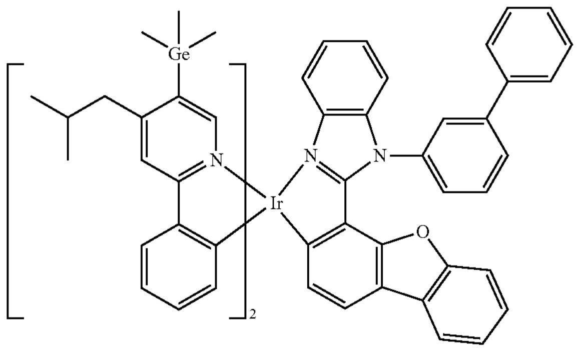
714
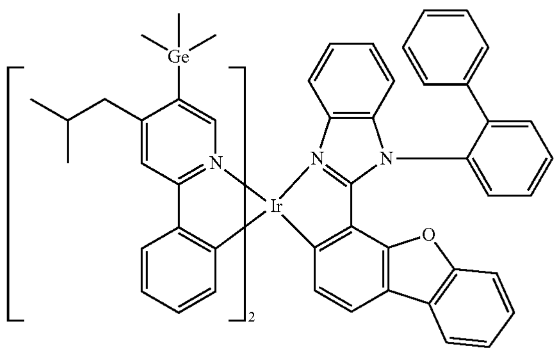
715
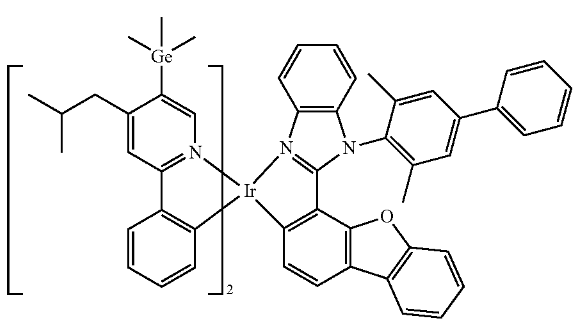
716
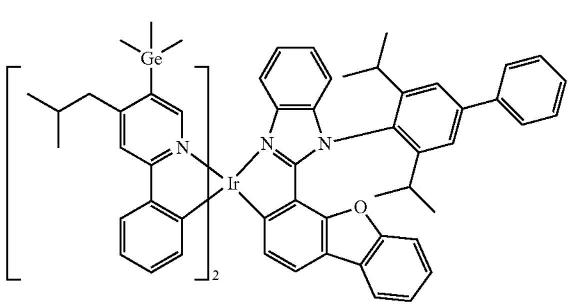
717
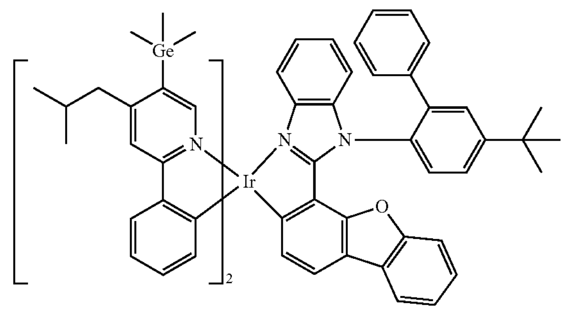
718
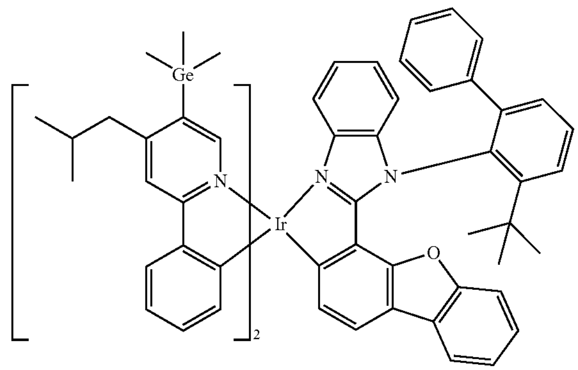
719
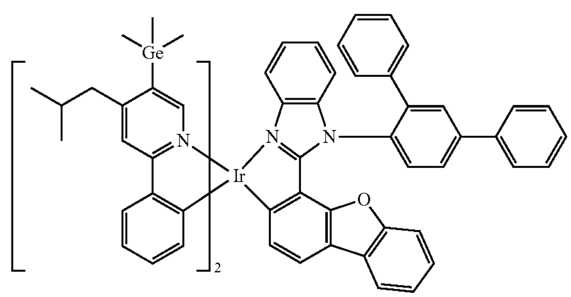
720
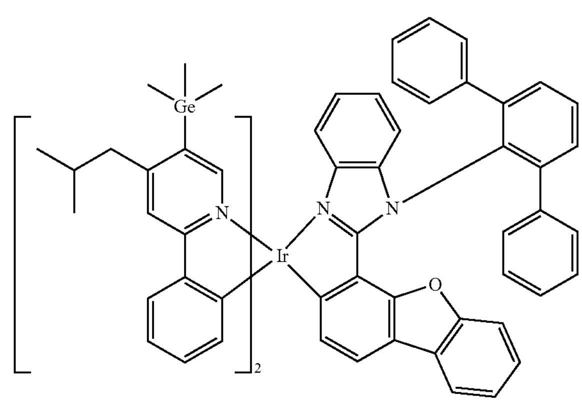

-continued
721
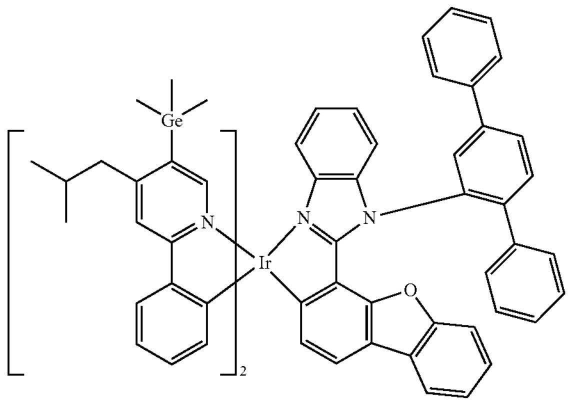
722
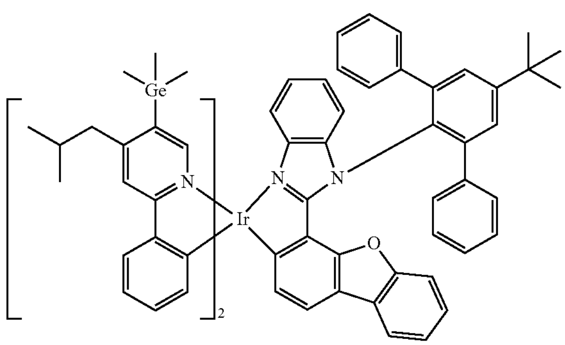
723
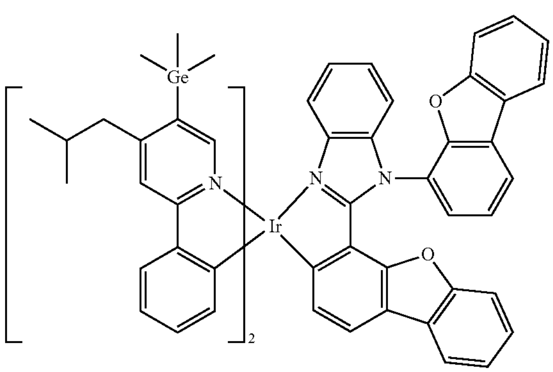
724
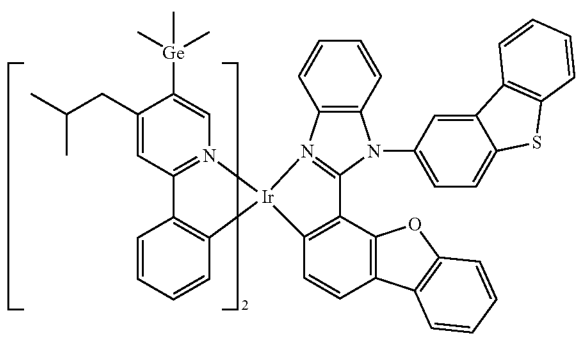
-continued
725
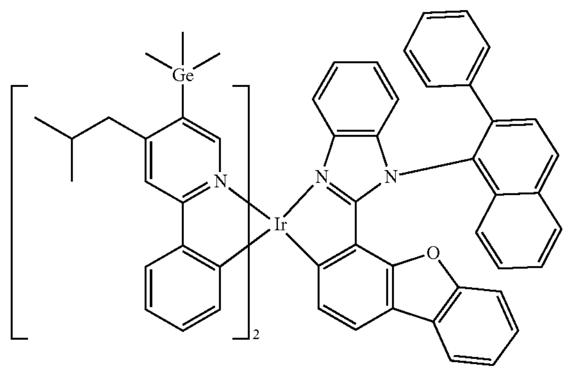
726
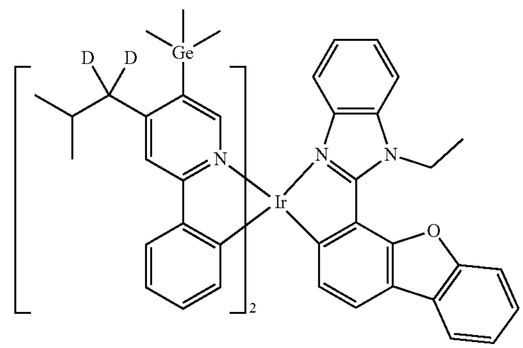
727
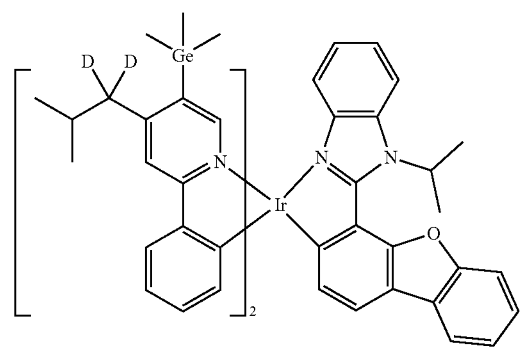
728
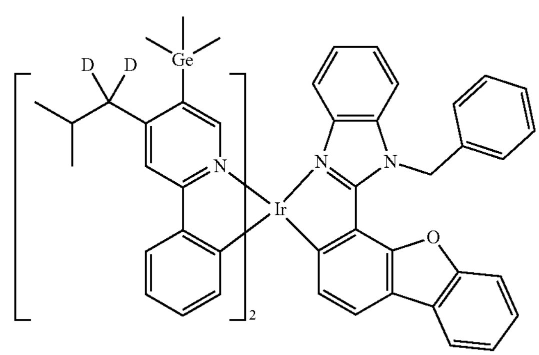

-continued
729
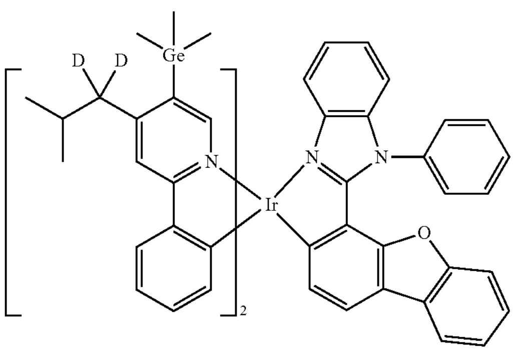
730
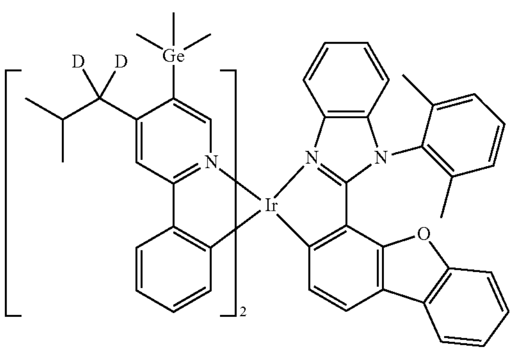
731
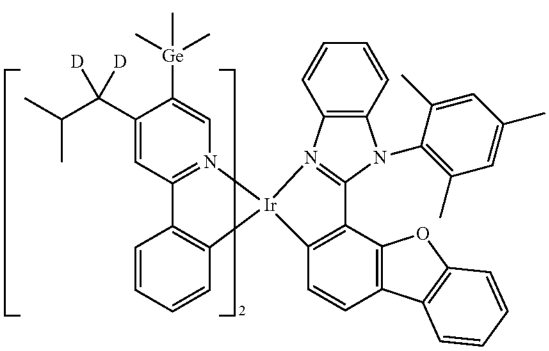
732
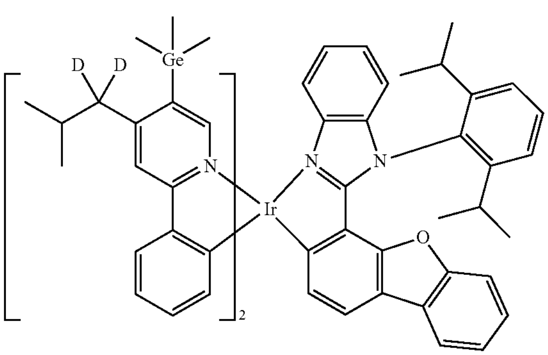
-continued
733
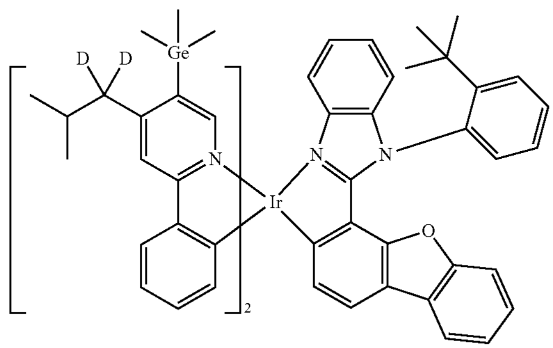
734
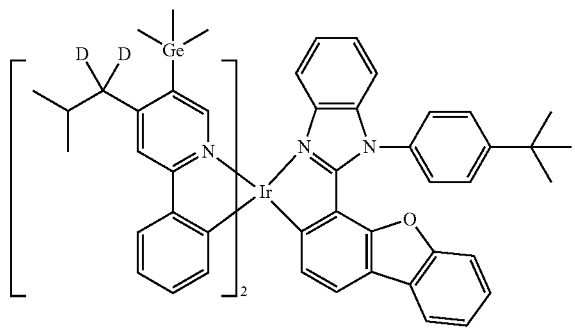
735
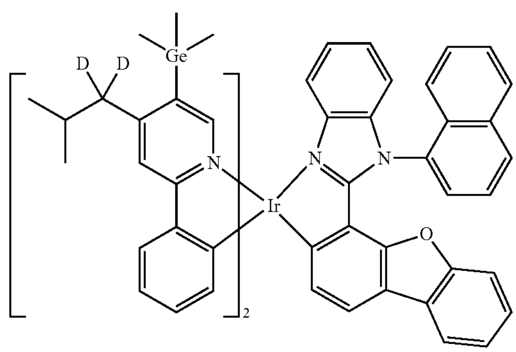
736
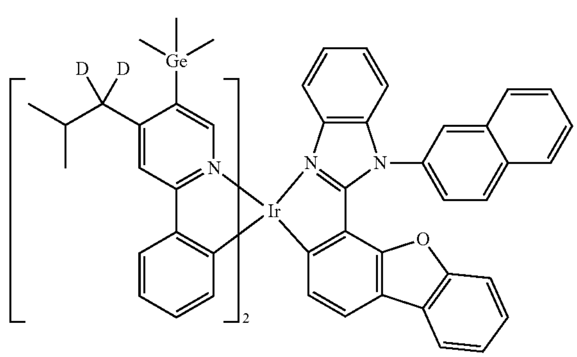

-continued
737
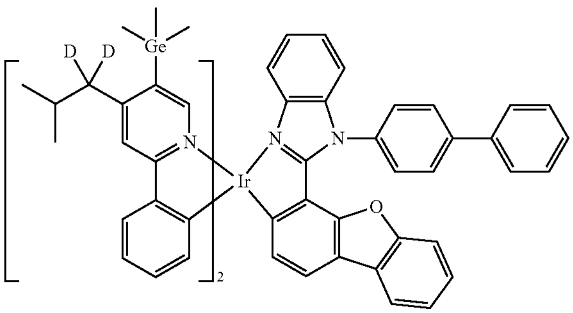
738
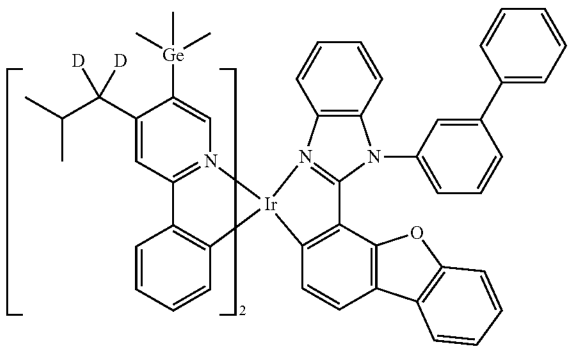
739
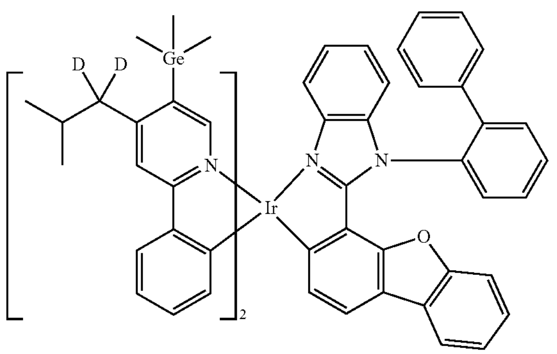
740
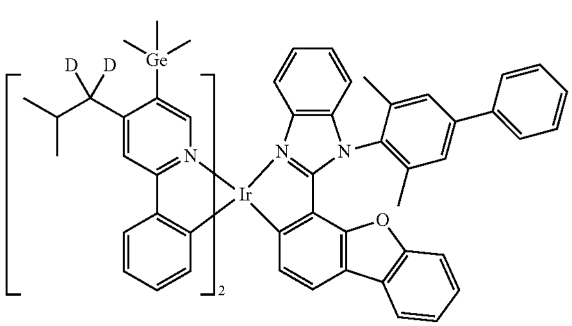
-continued
741
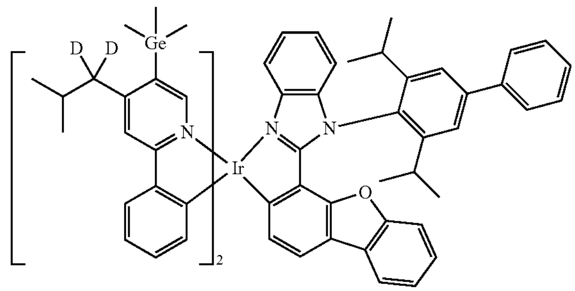
742
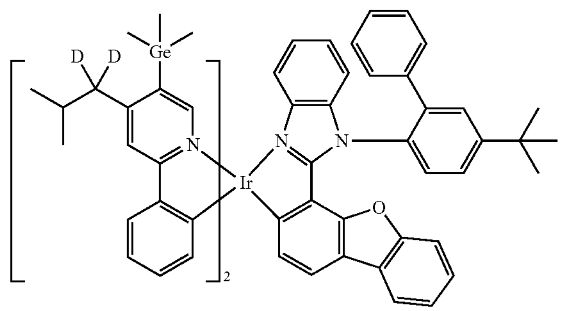
743
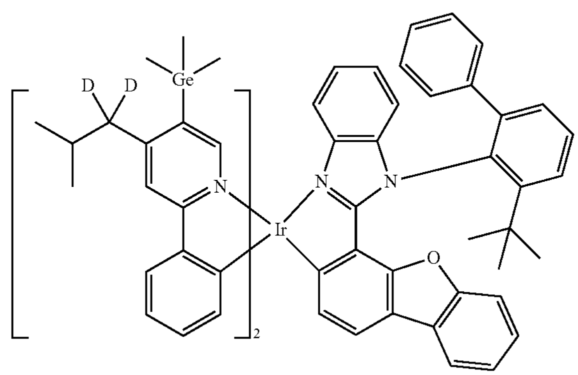
744
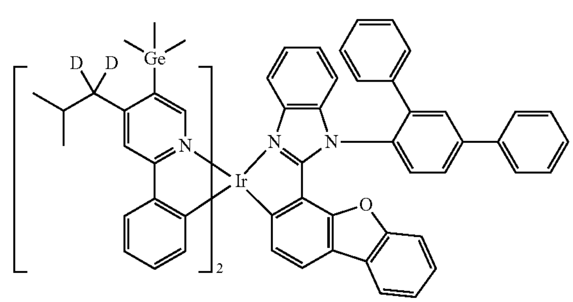

-continued
745
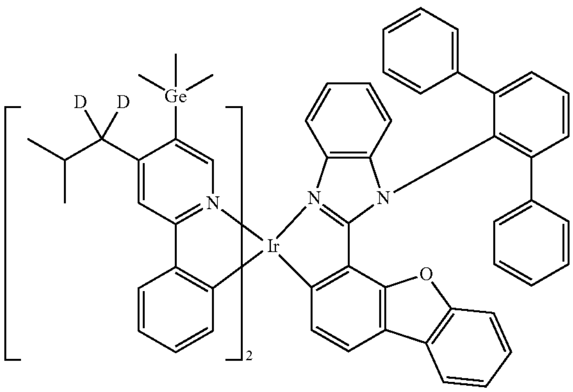
746
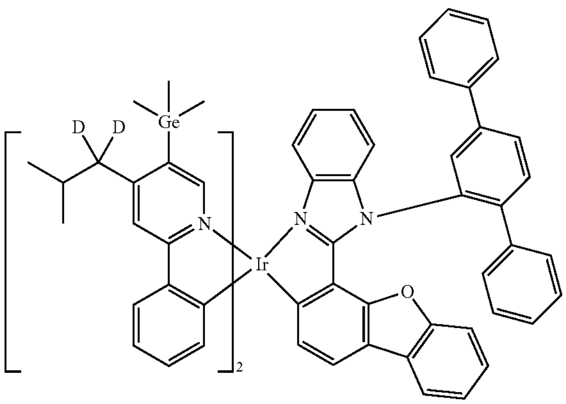
747
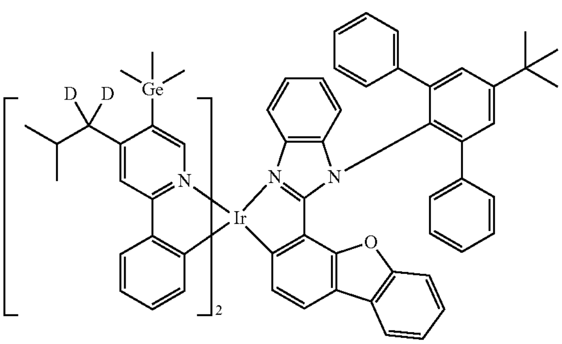
748
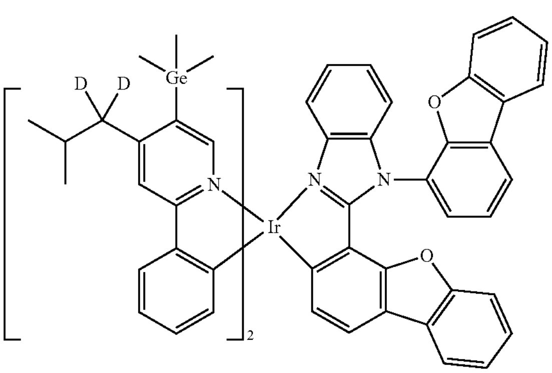
-continued
749
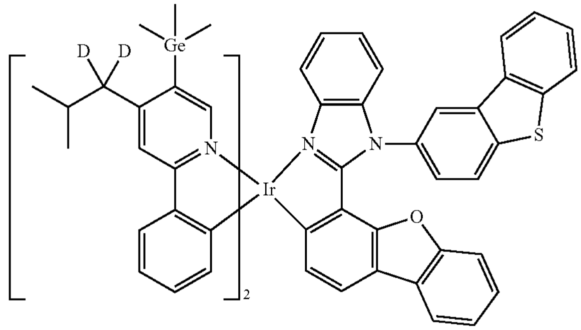
750
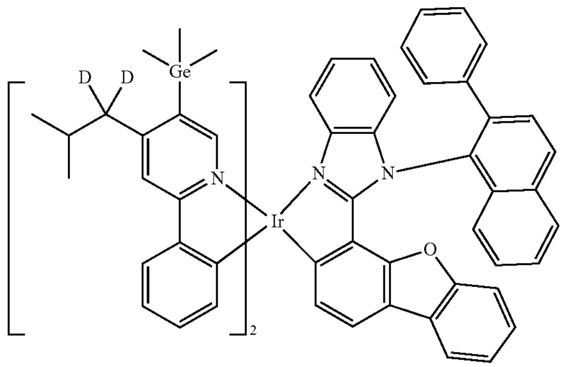
751
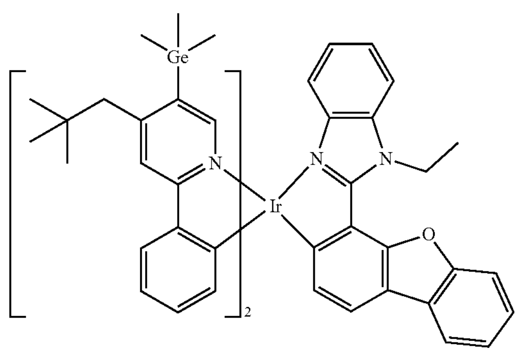
752
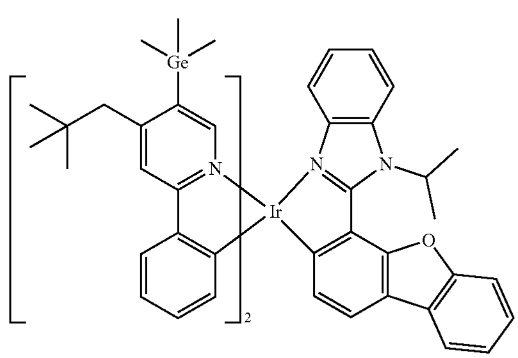

-continued
753
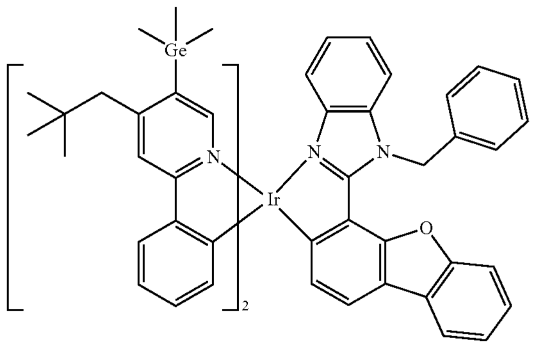
754
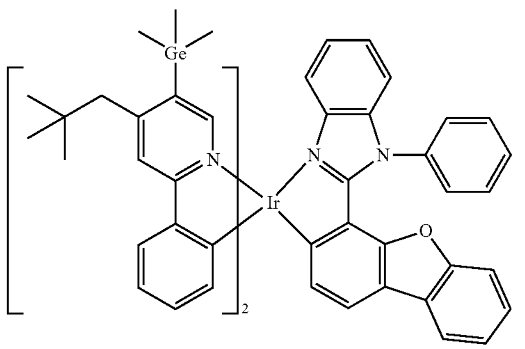
755
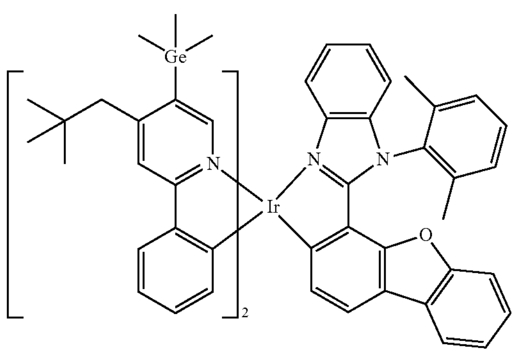
756
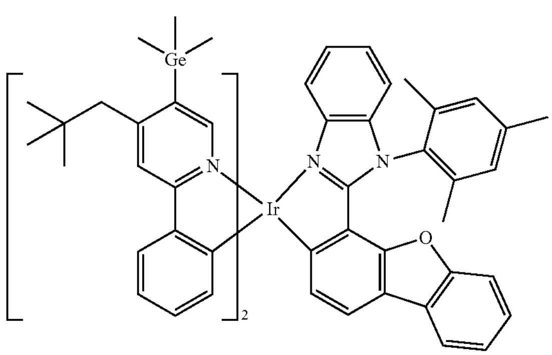
-continued
757
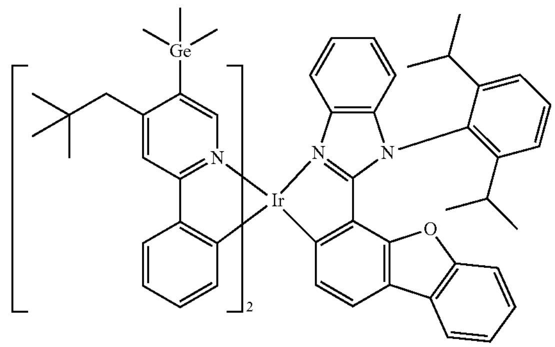
758
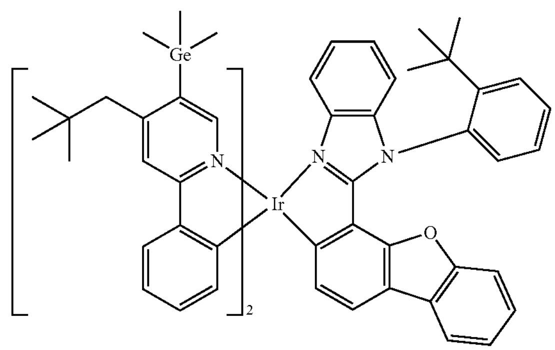
759
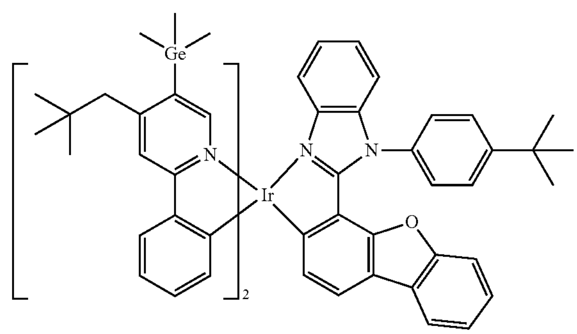
760
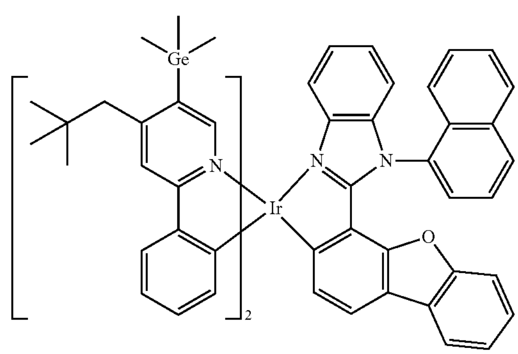

761
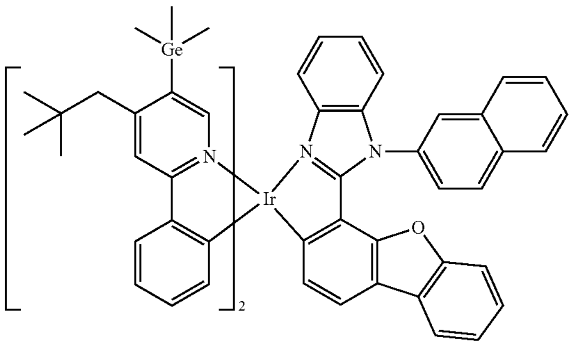
762
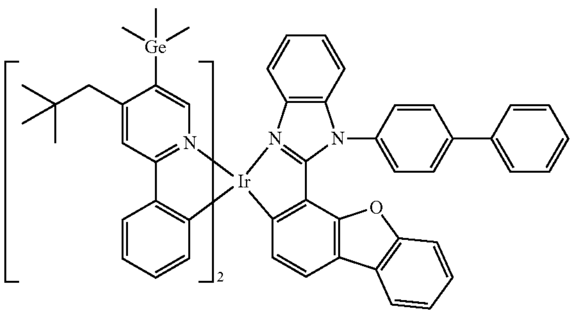
763
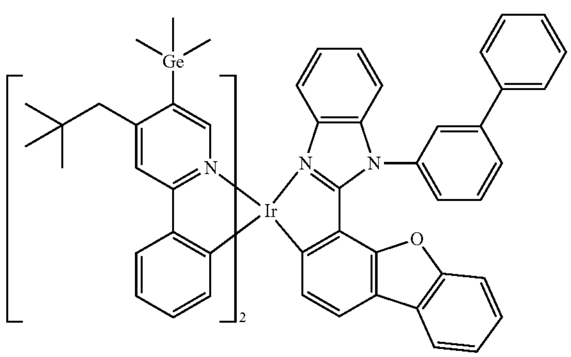
764
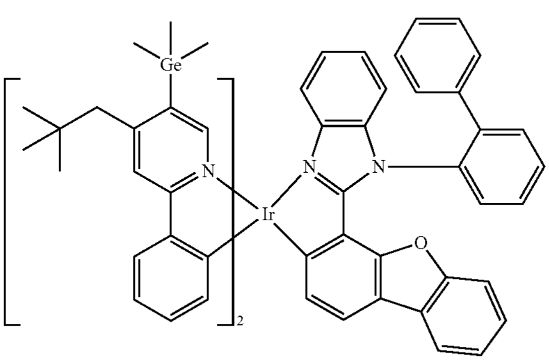
765
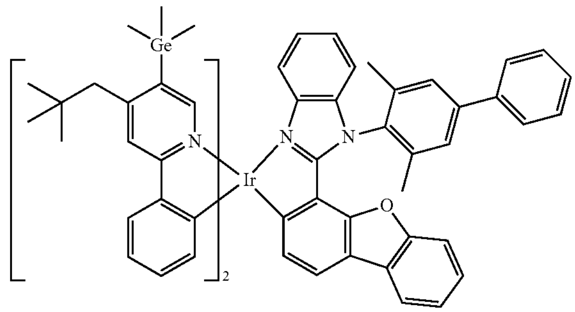
766
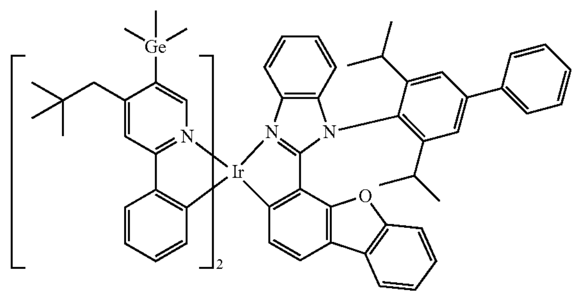
767
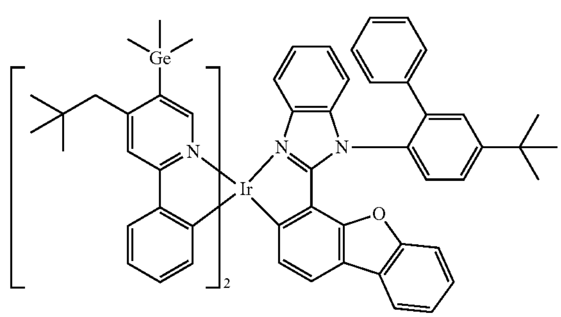
768
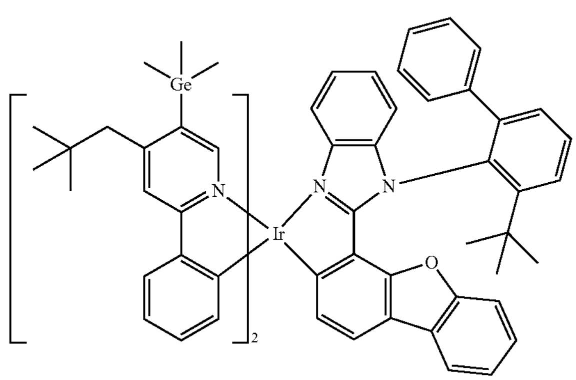

-continued
769
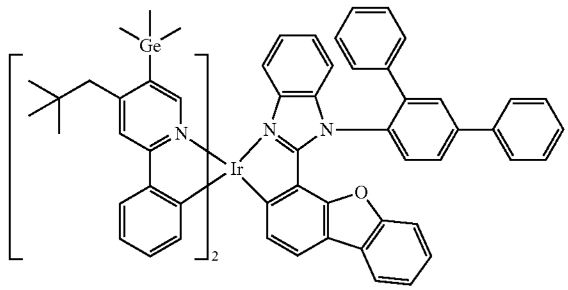
770
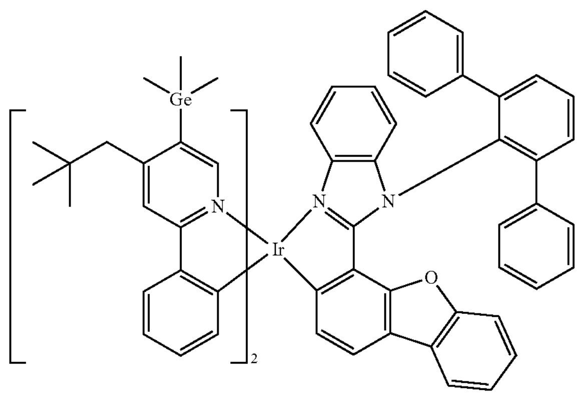
771
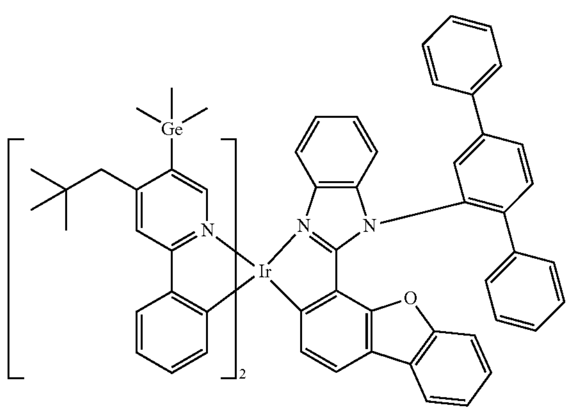
772
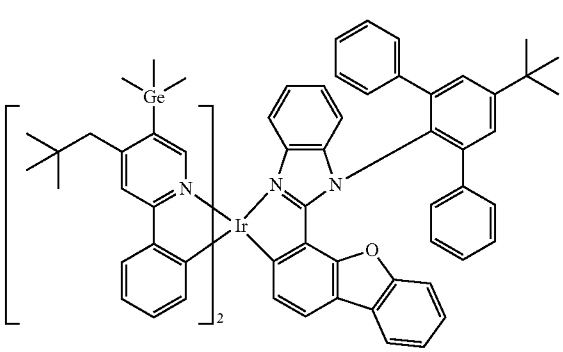
-continued
773
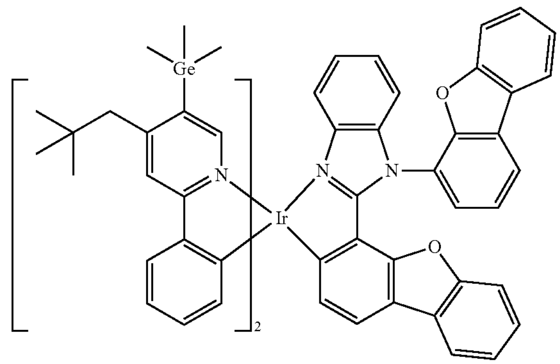
774
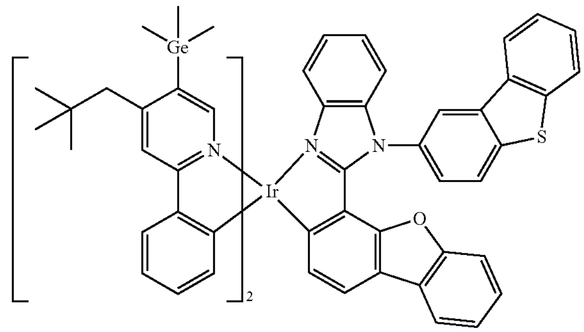
775
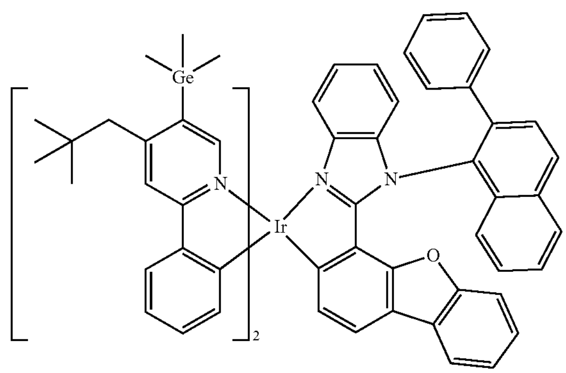
776
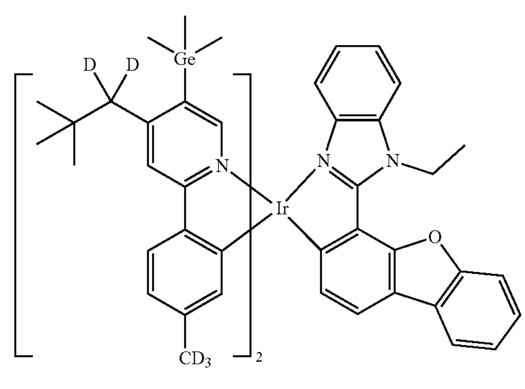

-continued
777
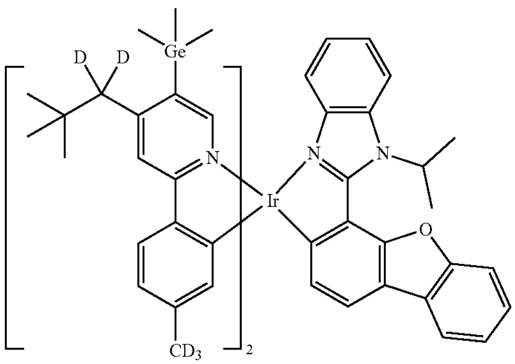
778
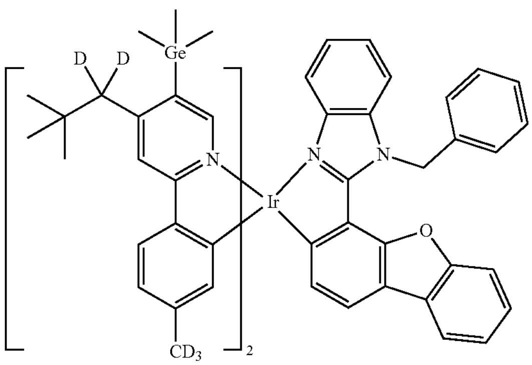
779
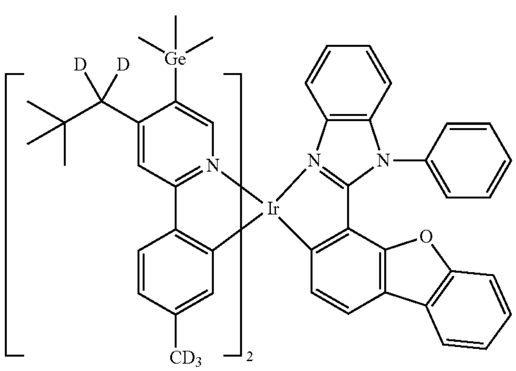
780
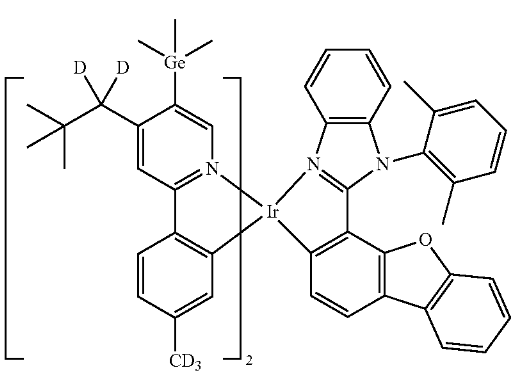
-continued
781
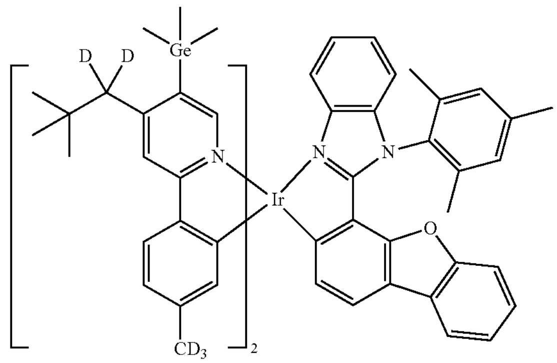
782
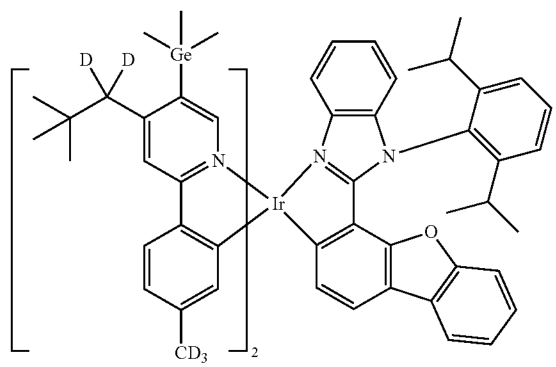
783
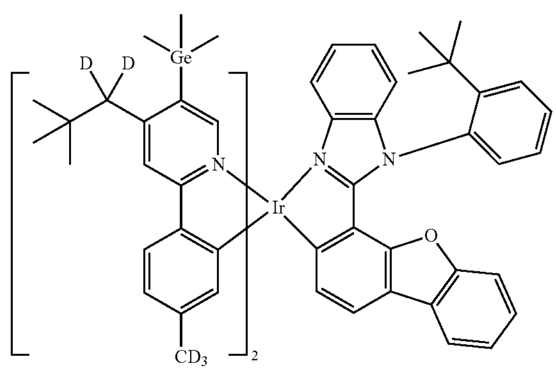
784
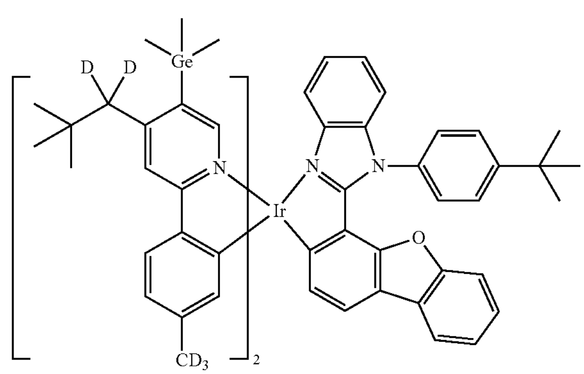

-continued
785
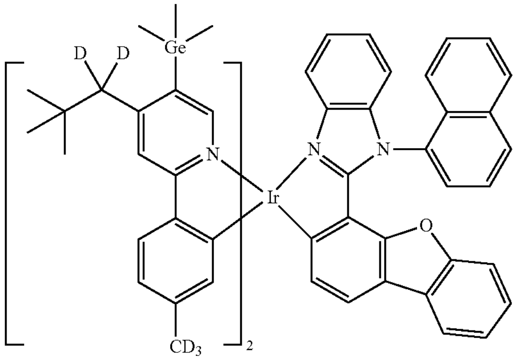
786
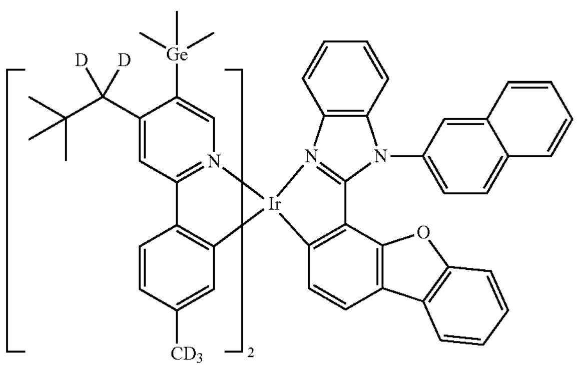
787
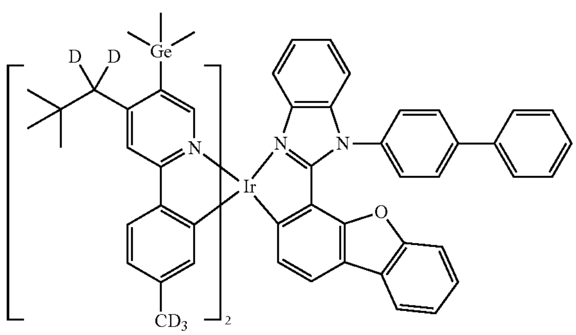
788
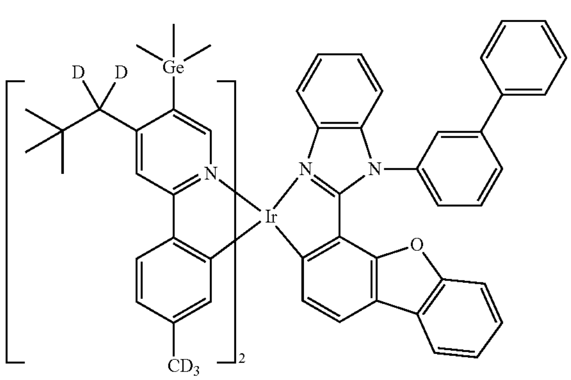
-continued
789
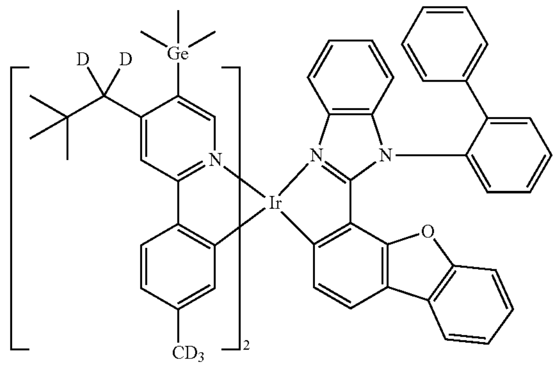
790
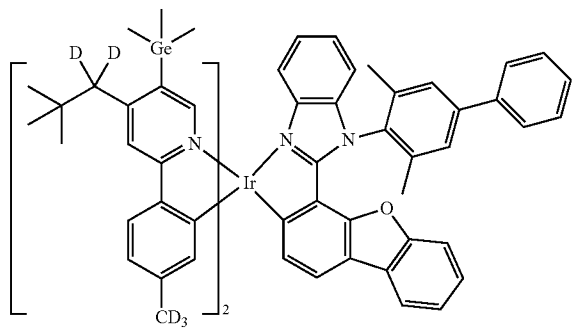
791
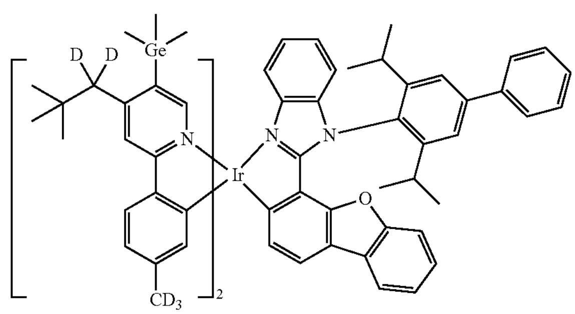
792
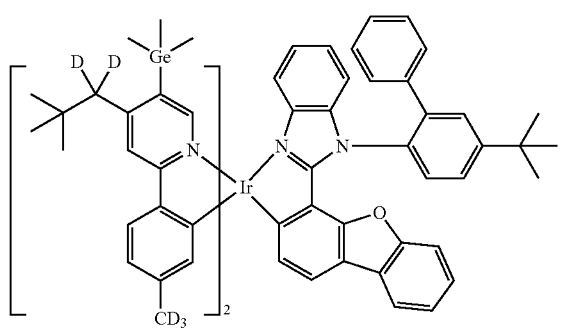

793
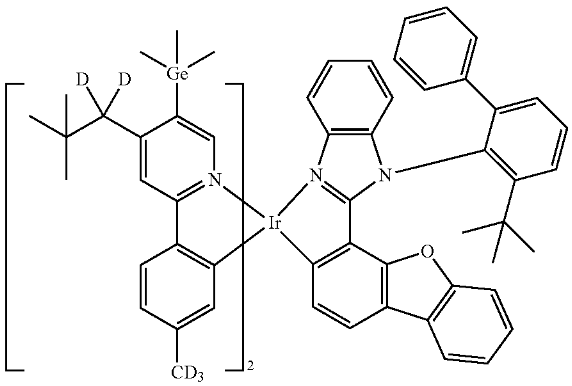
794
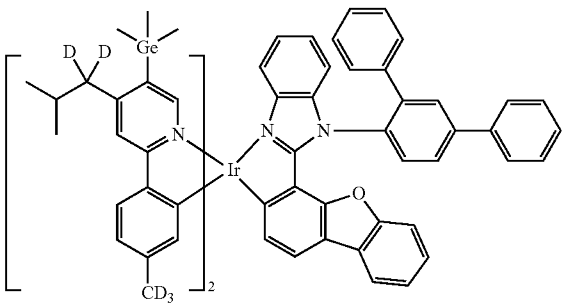
795
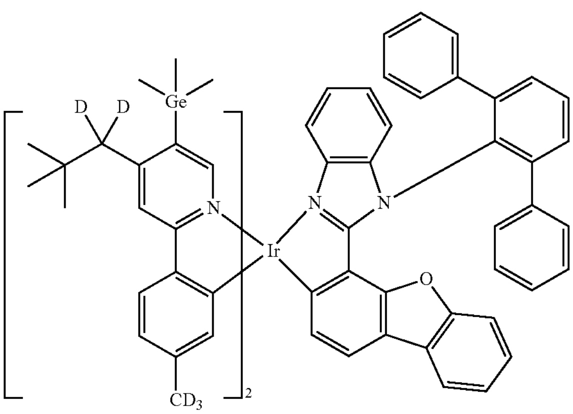
796
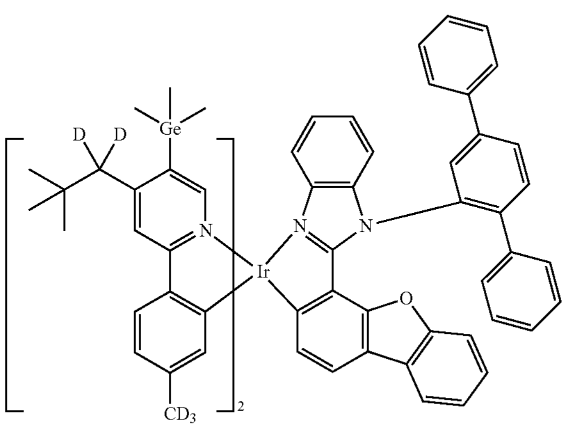
797
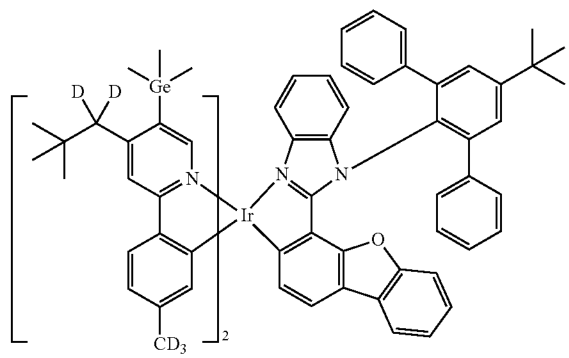
798
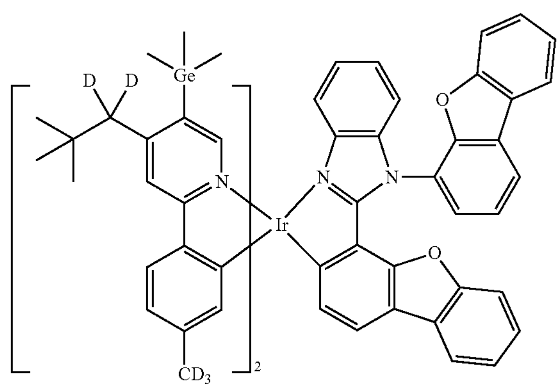
799
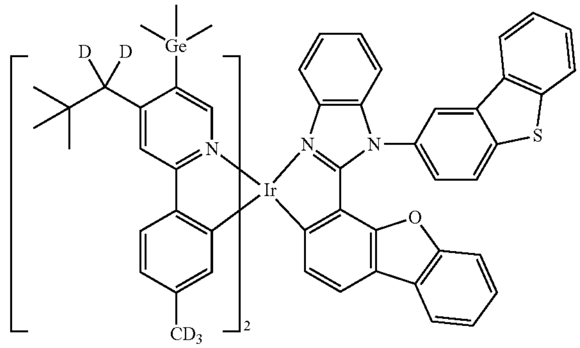
800
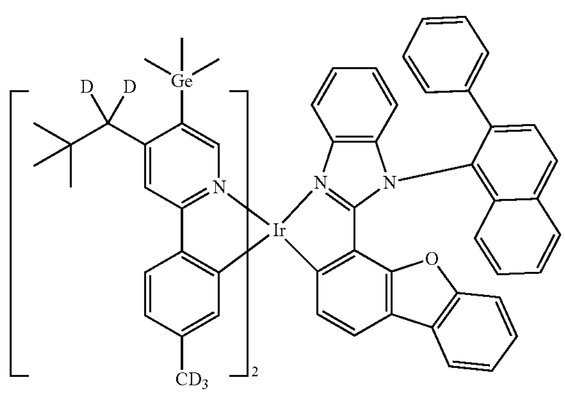

-continued
801
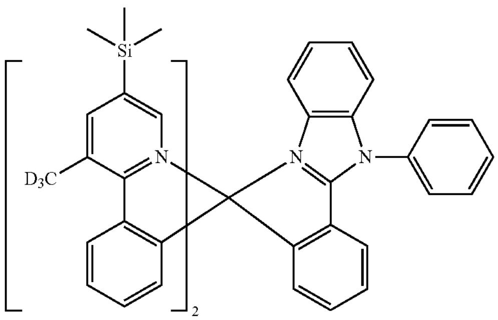
802
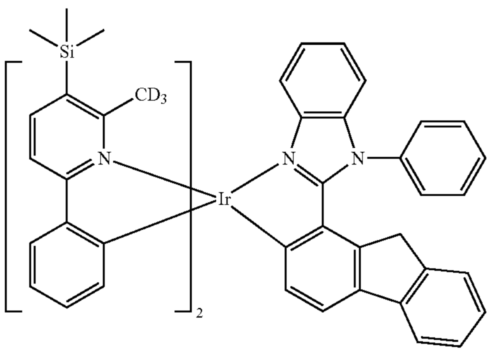
803
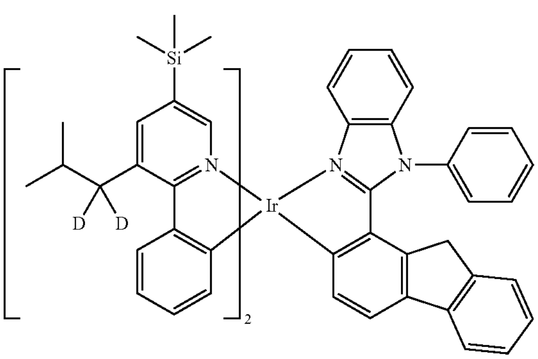
804
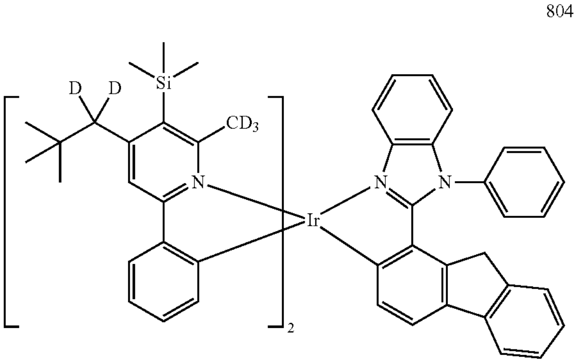
-continued
805
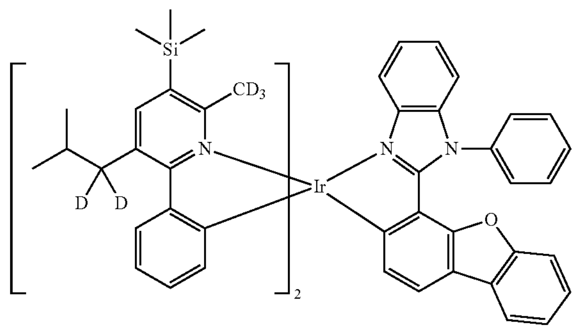
806
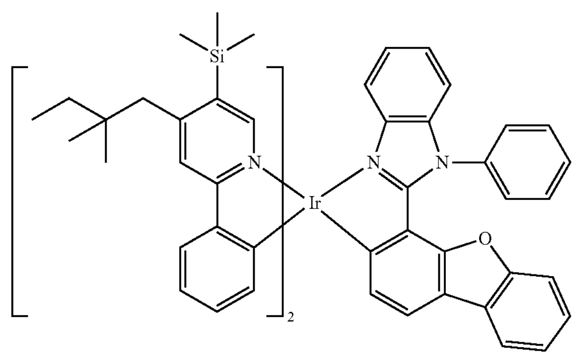
807
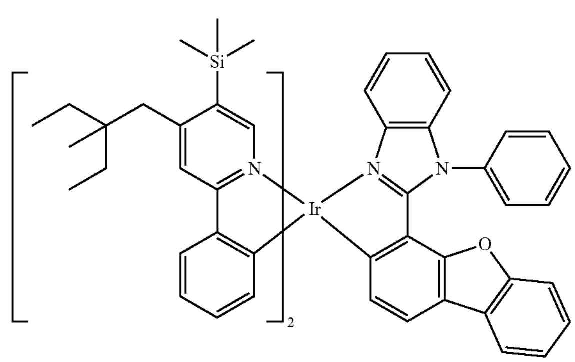
808
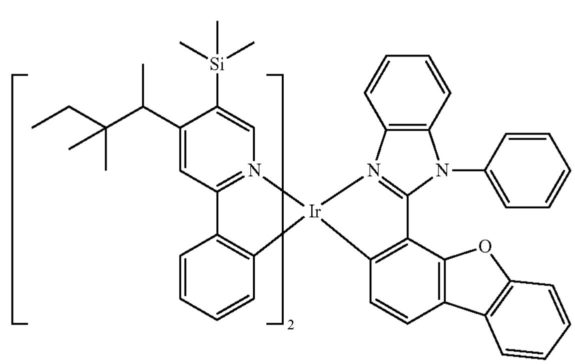

-continued
809
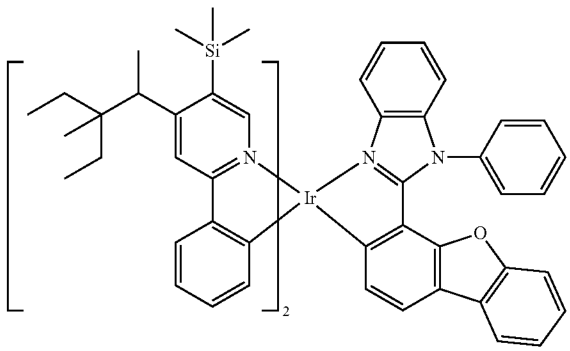
810
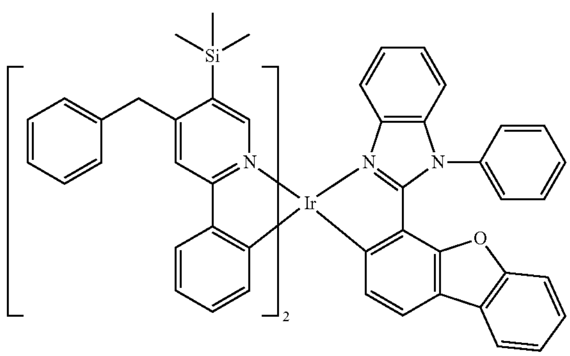
811
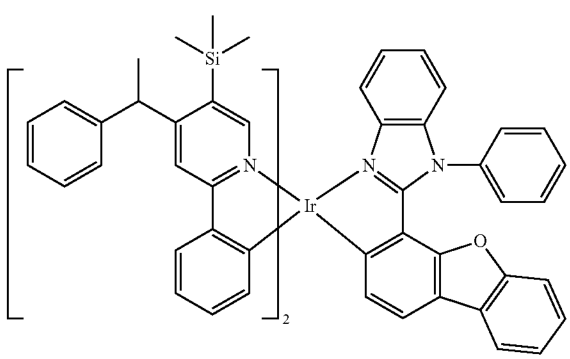
812
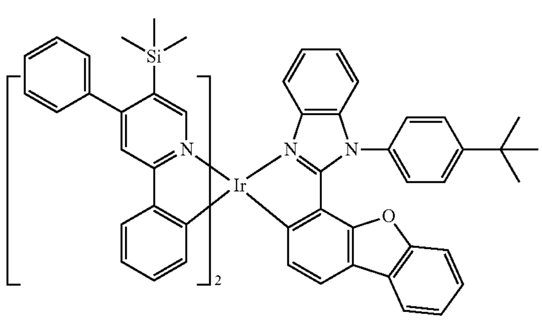
-continued
813
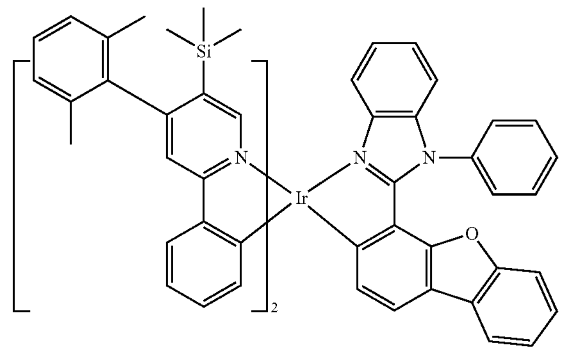
814
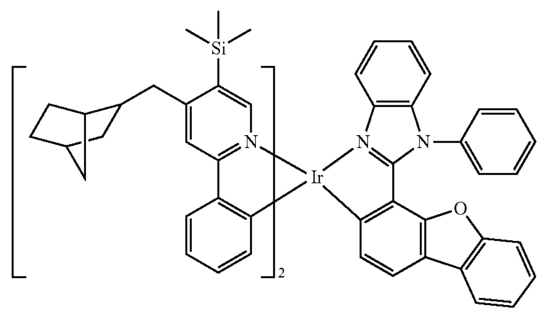
815
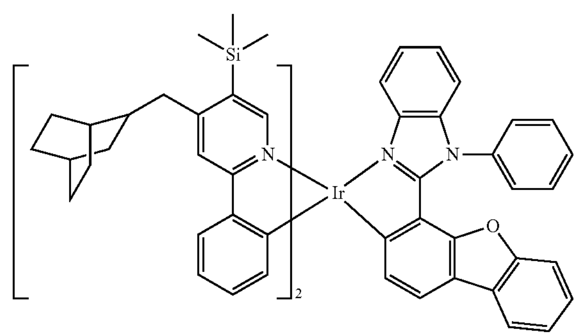
816
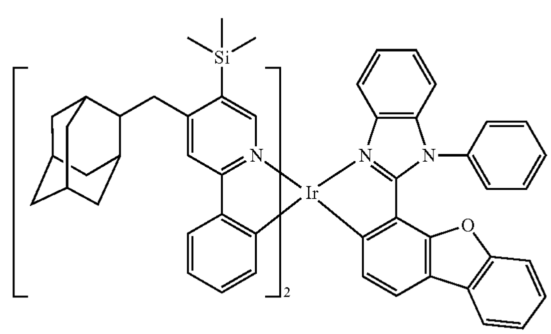

-continued
817
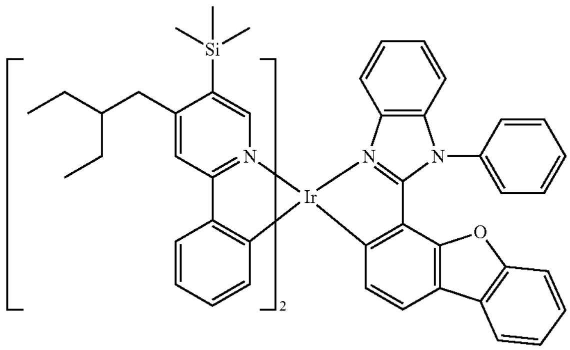
818
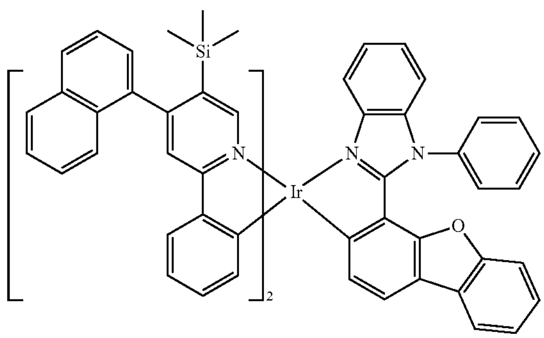
819
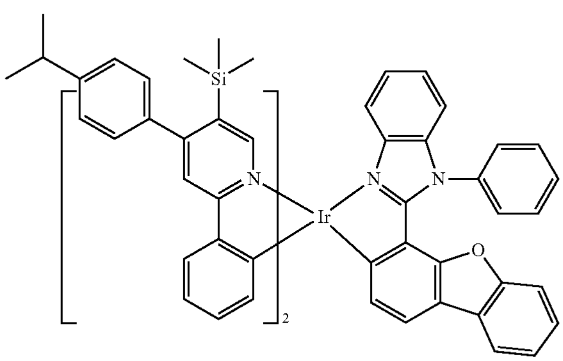
820
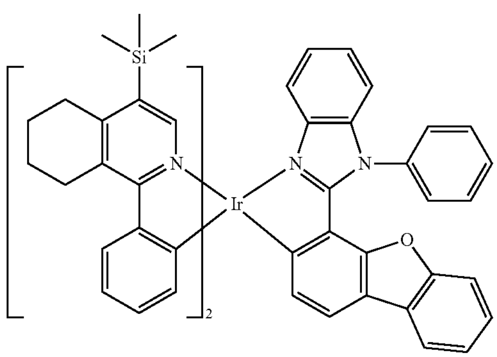
-continued
821
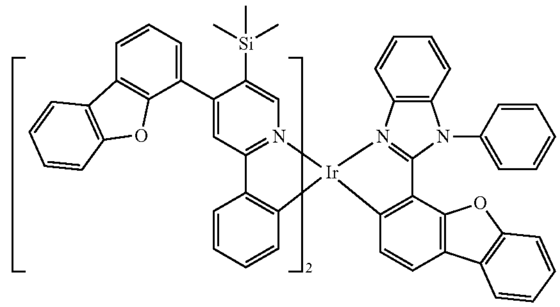
822
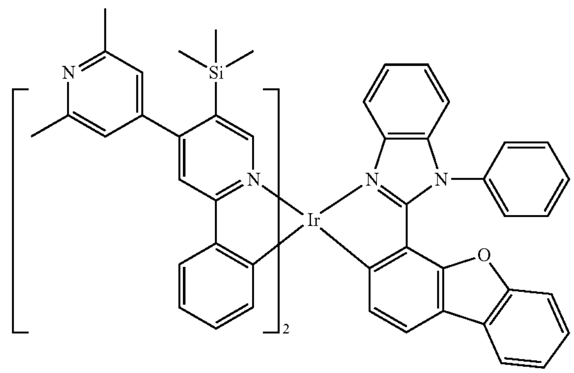
823
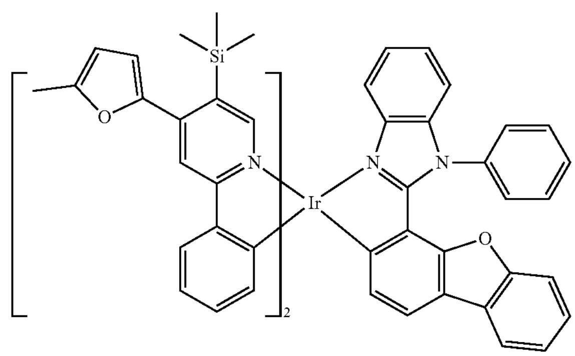
824
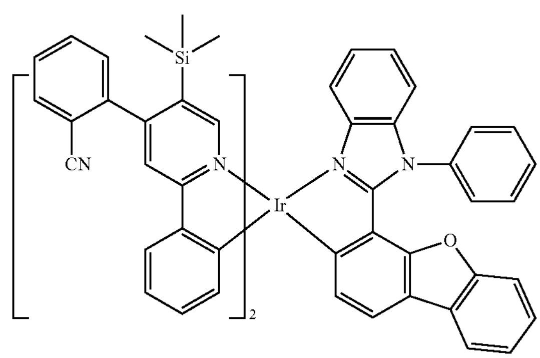

-continued
825
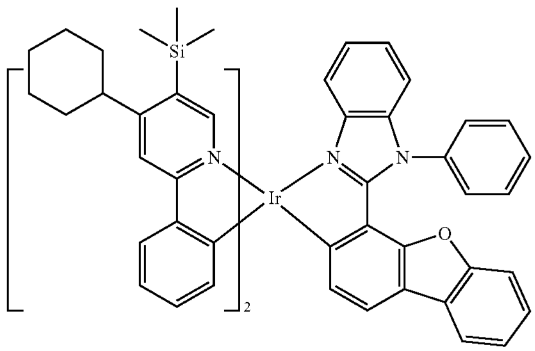
826
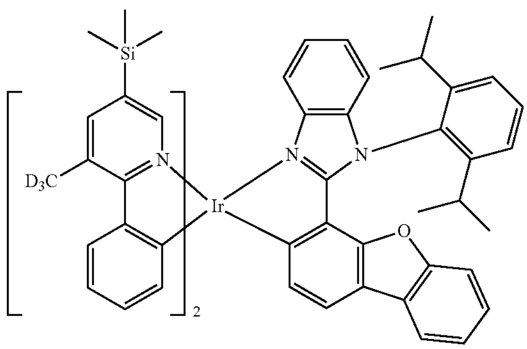
827
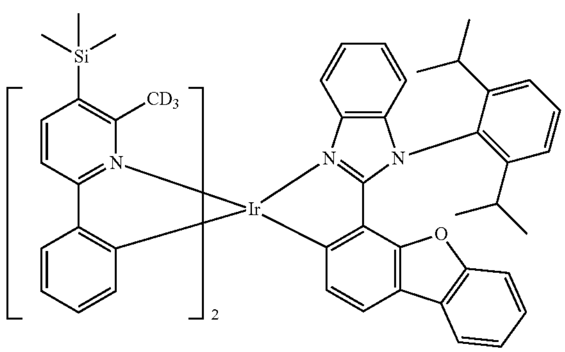
828
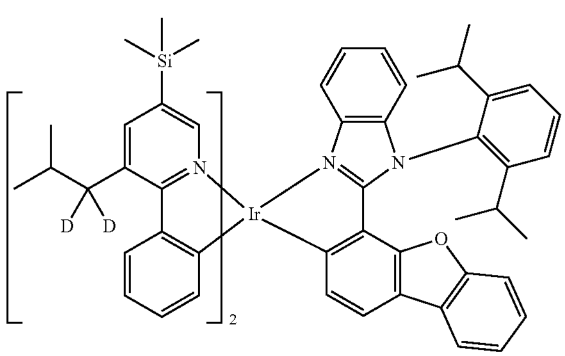
-continued
829
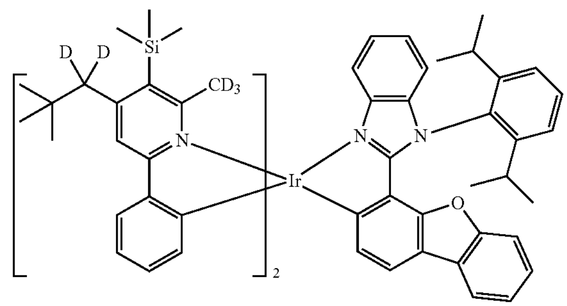
830
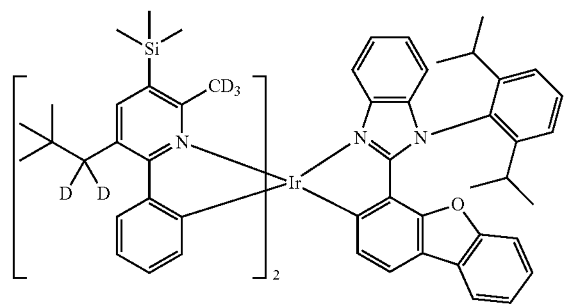
831
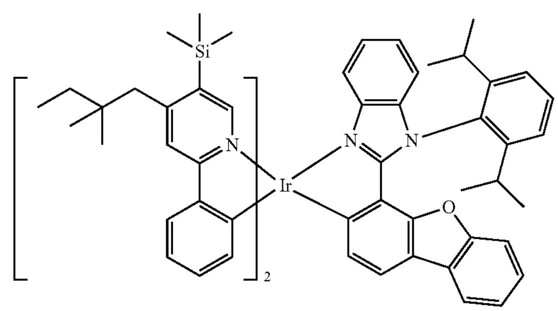
832
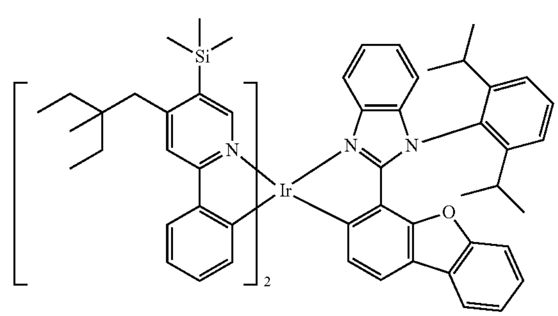
833
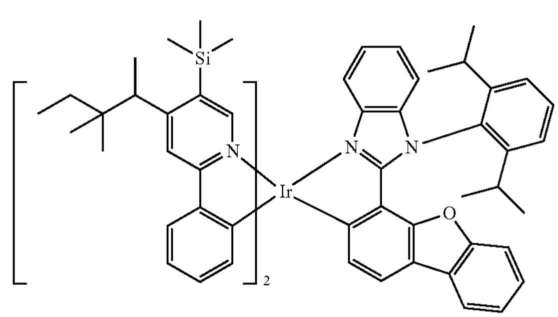

-continued
834
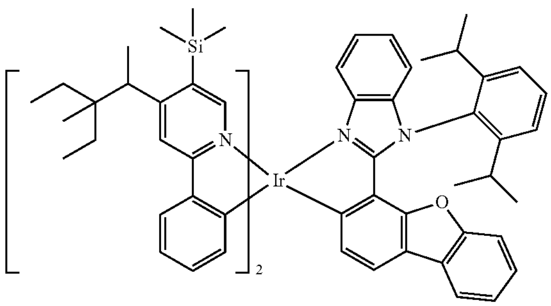
835
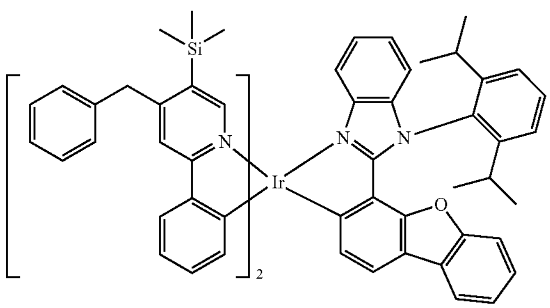
836
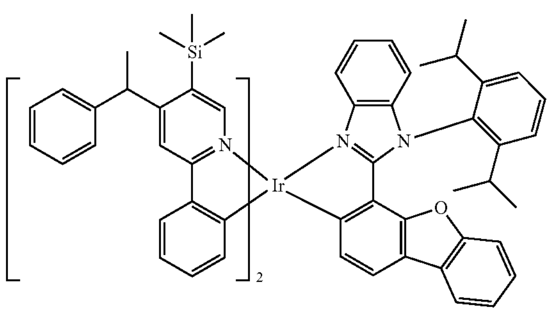
837
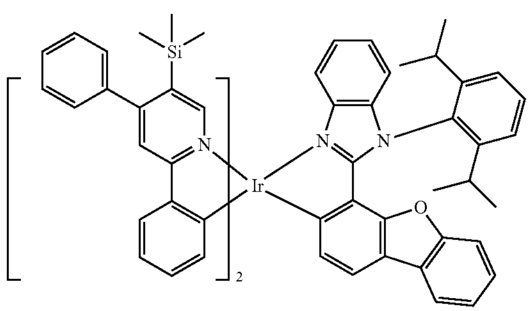
838
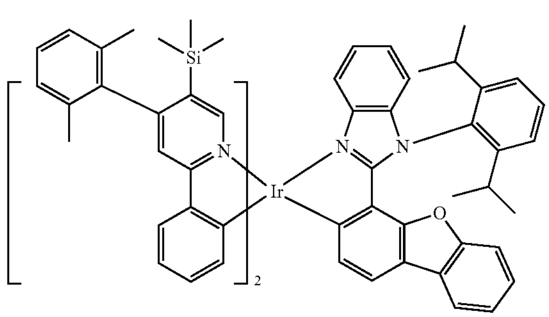
-continued
839
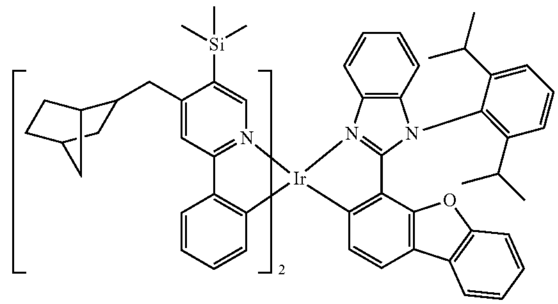
840
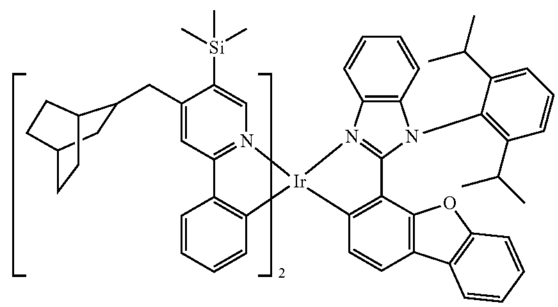
841
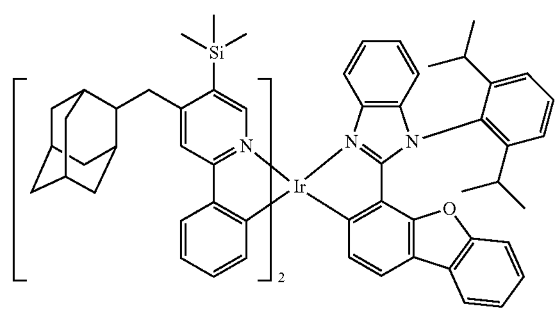
842
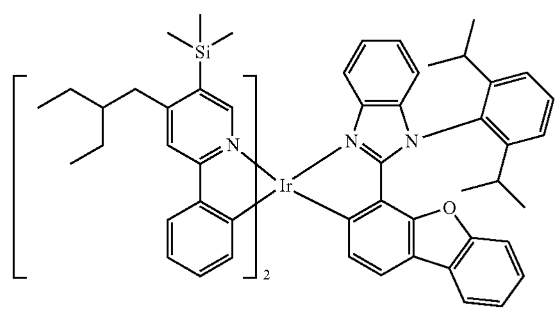
843
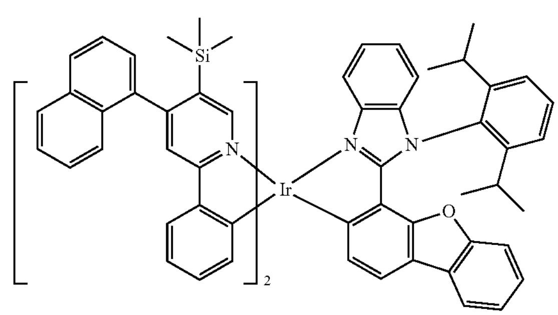

-continued
844
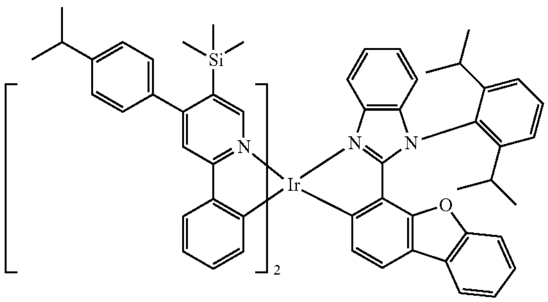
845
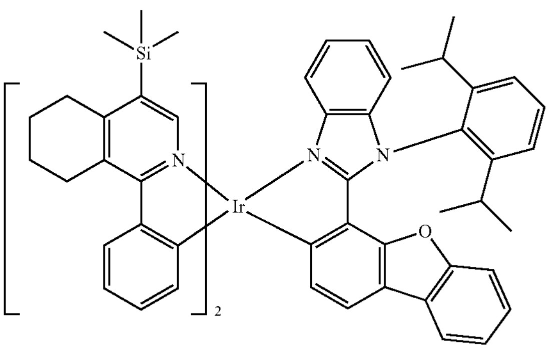
846
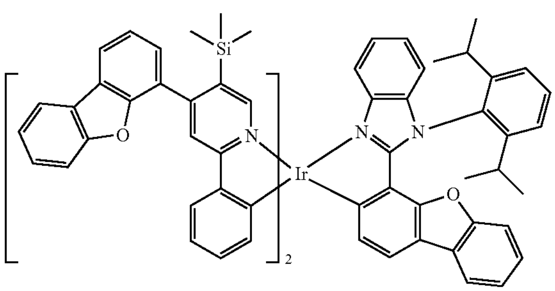
847
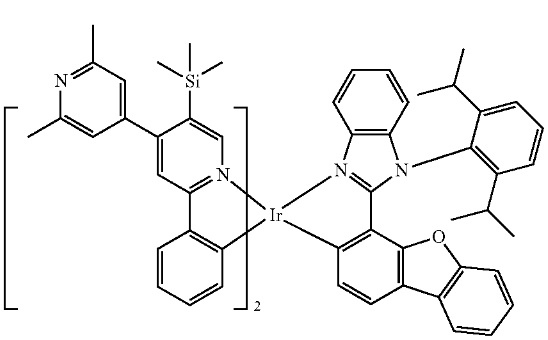
-continued
848
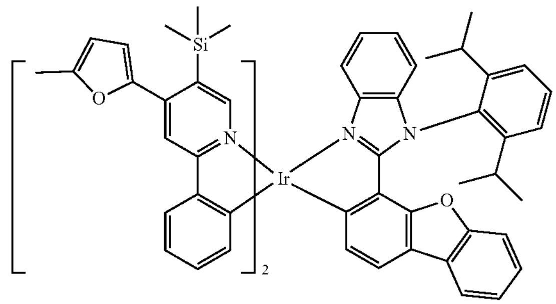
849
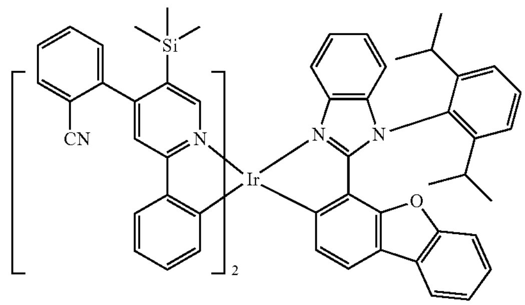
850
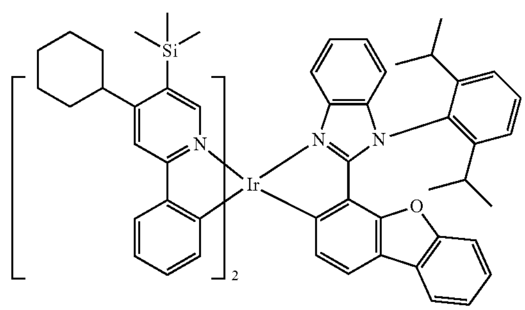
851
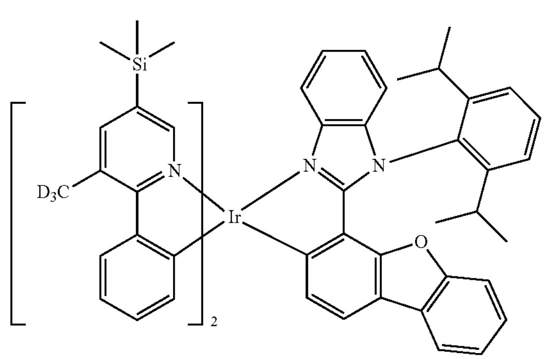

-continued
852
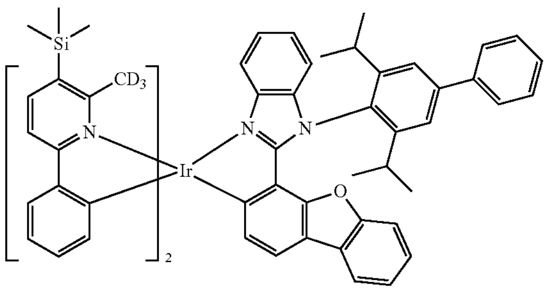
853
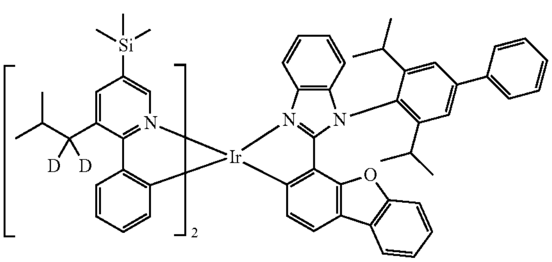
854
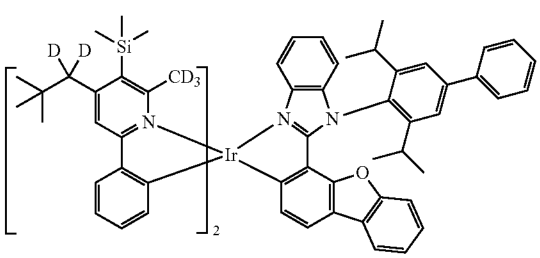
855
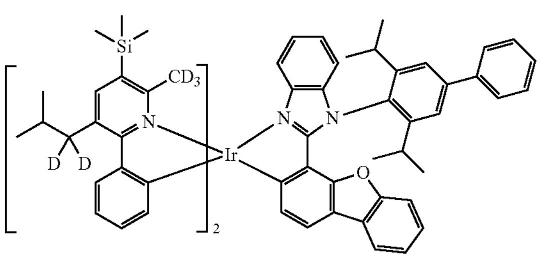
856
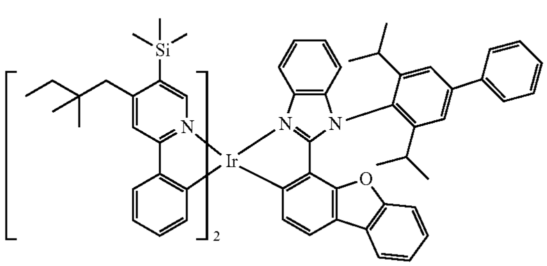
-continued
857
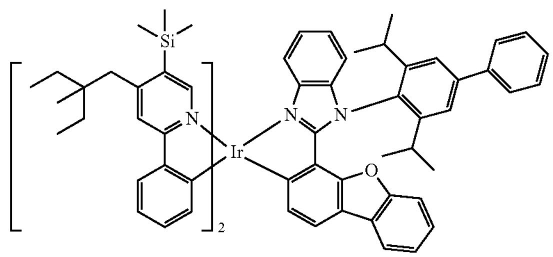
858
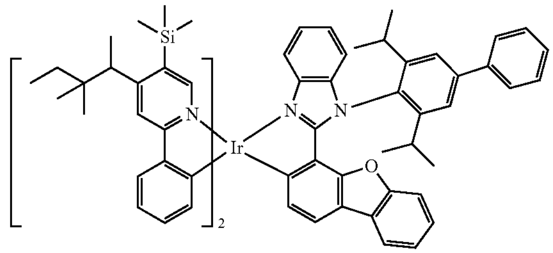
859
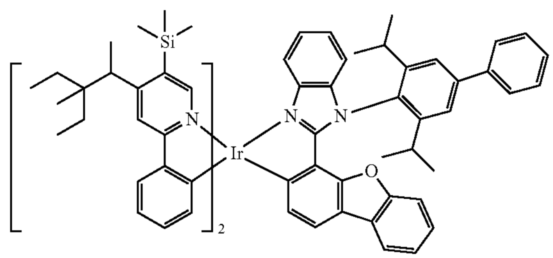
860
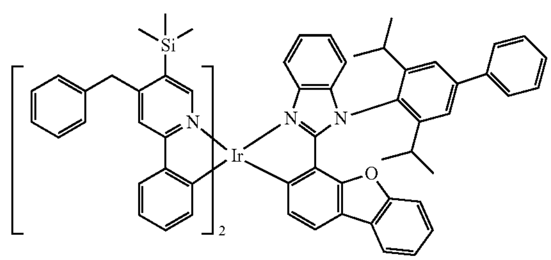
861
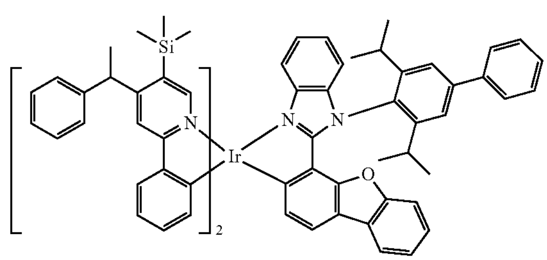

862
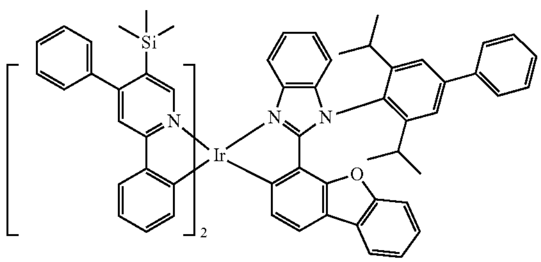
863
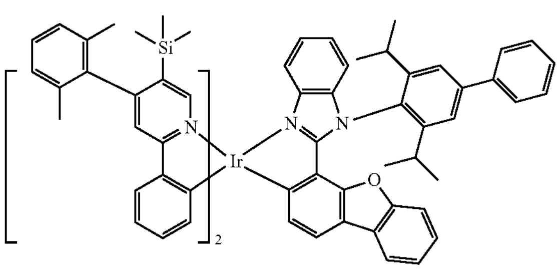
864
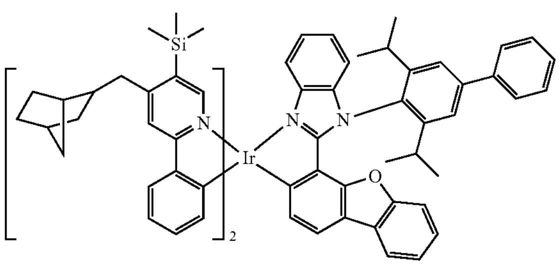
865
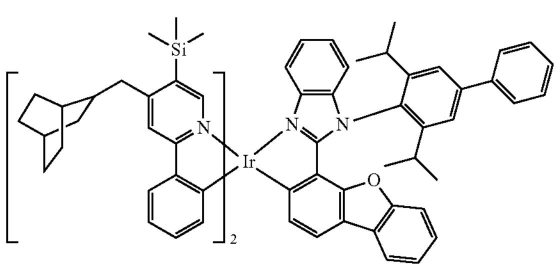
866
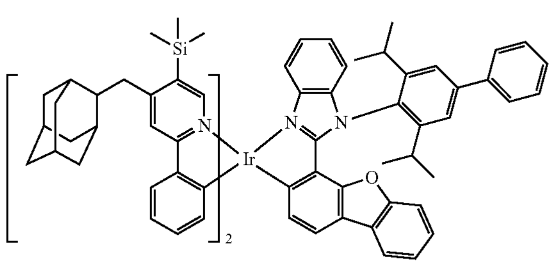
867
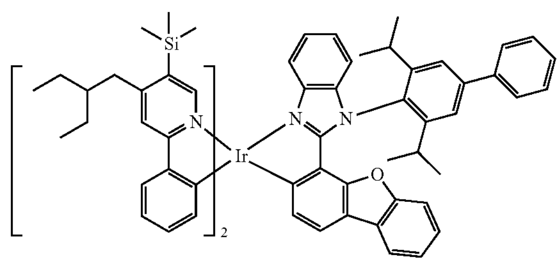
868
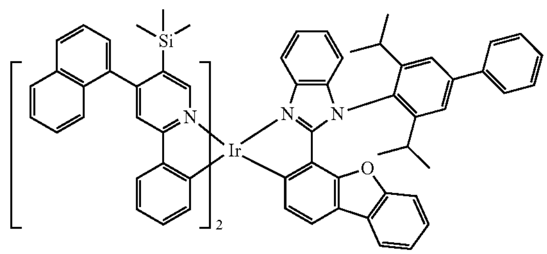
869
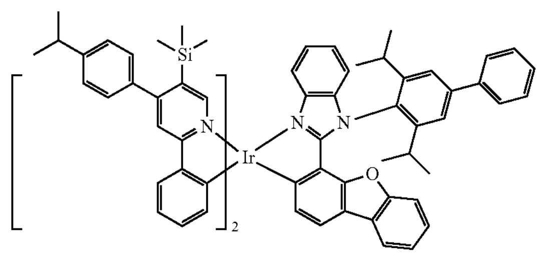
870
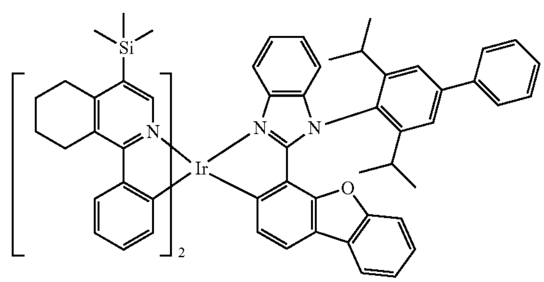
871
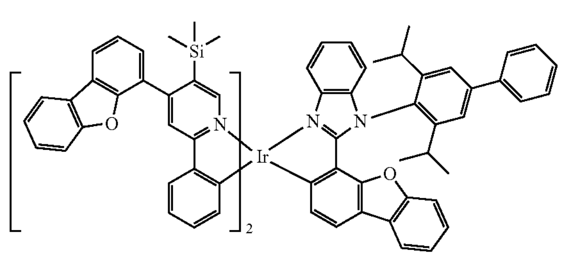

-continued
872
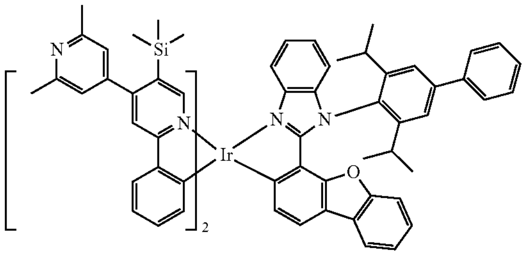
873
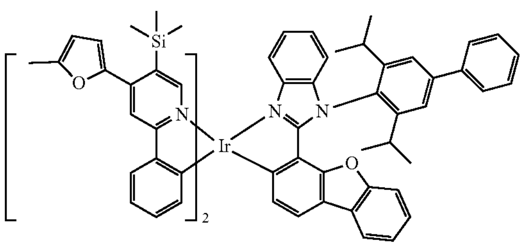
874
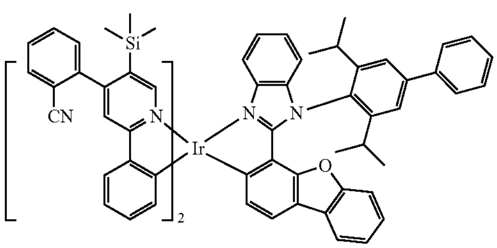
875
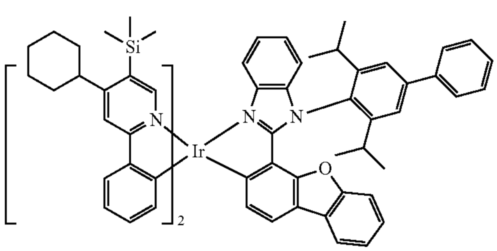
876
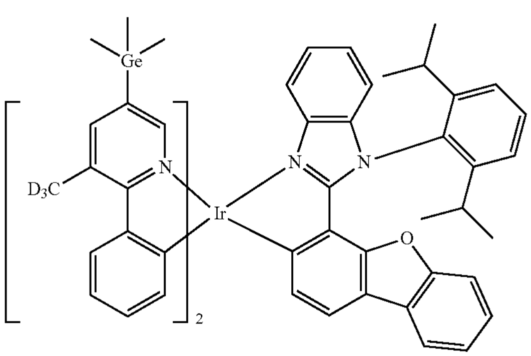
-continued
877
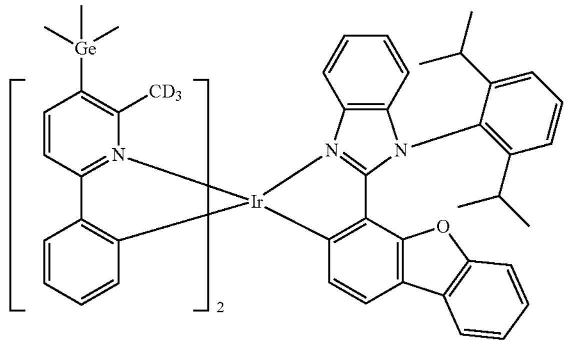
878
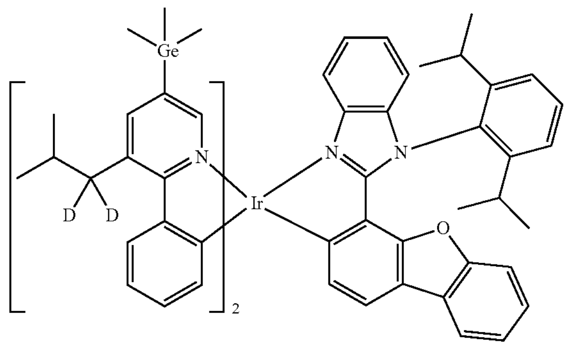
879
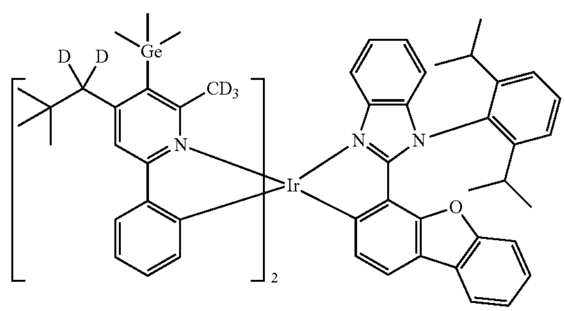
880
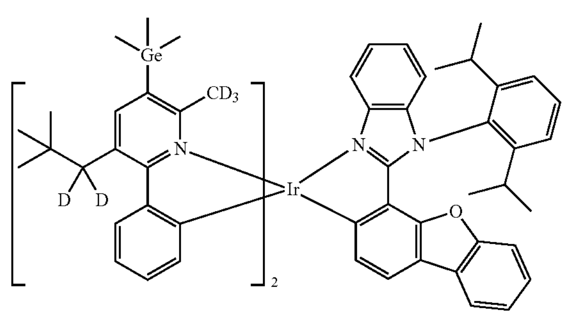

-continued
881
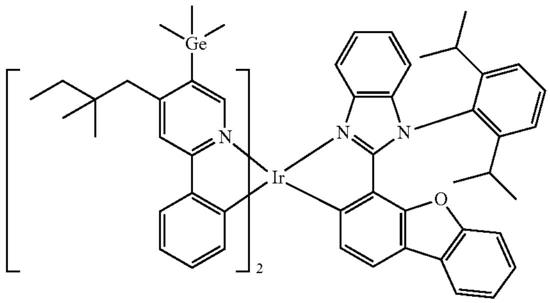
882
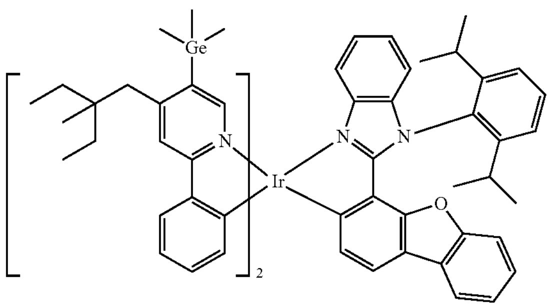
883
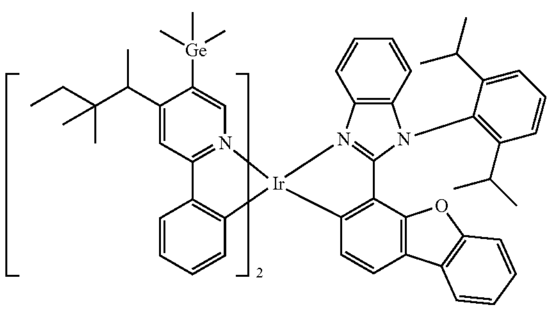
884
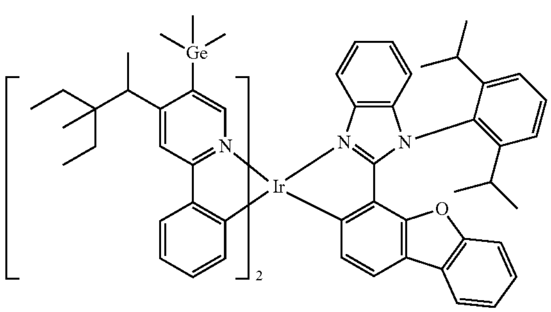
885
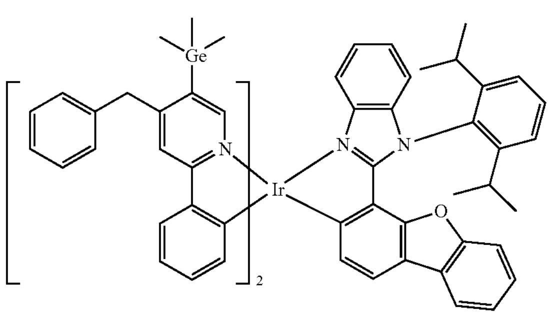
-continued
886
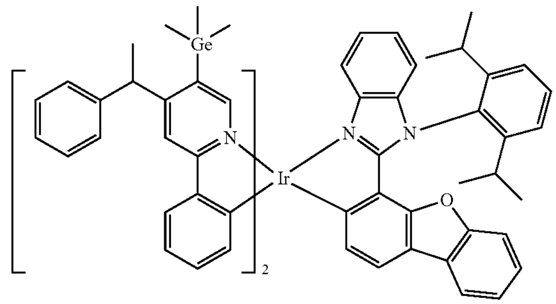
887
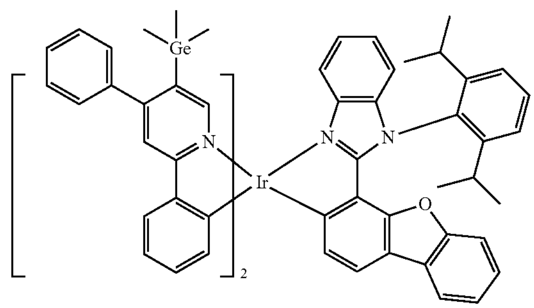
888
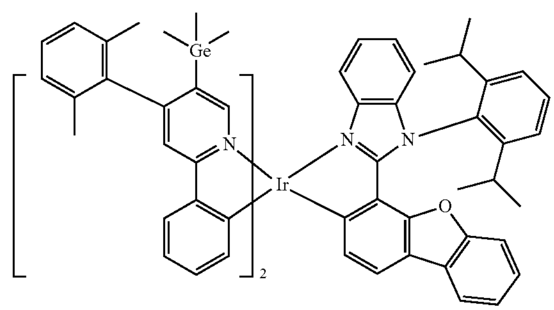
889
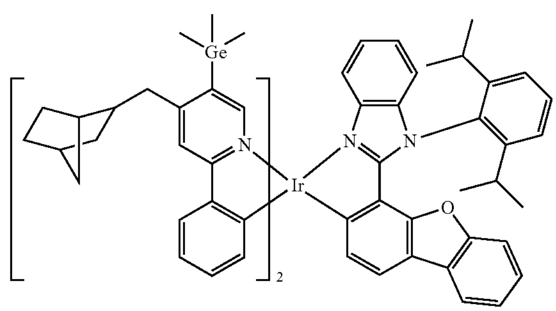
890
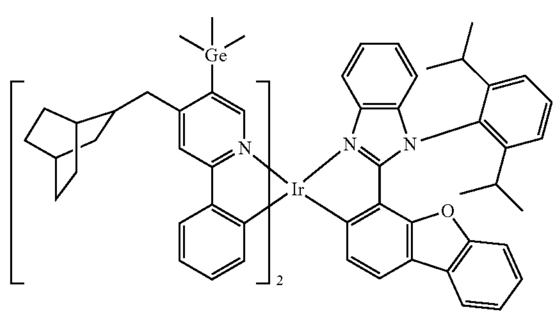

-continued
891
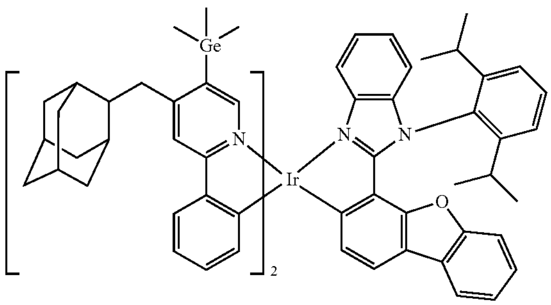
892
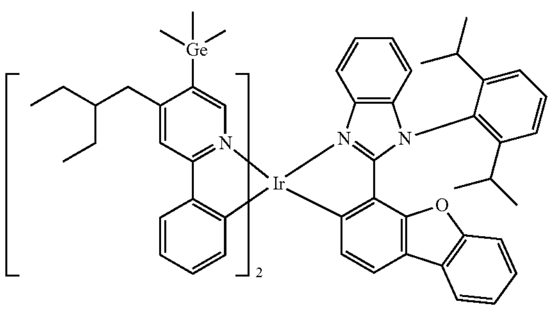
893
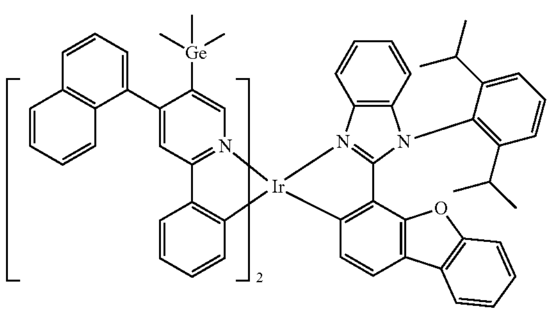
894
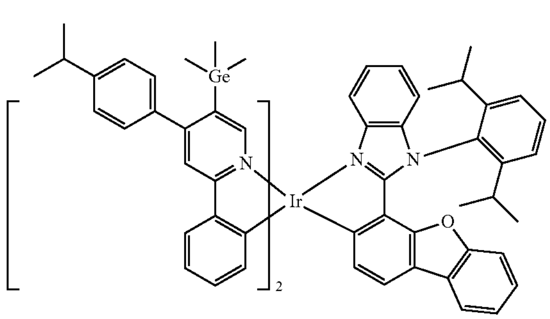
-continued
895
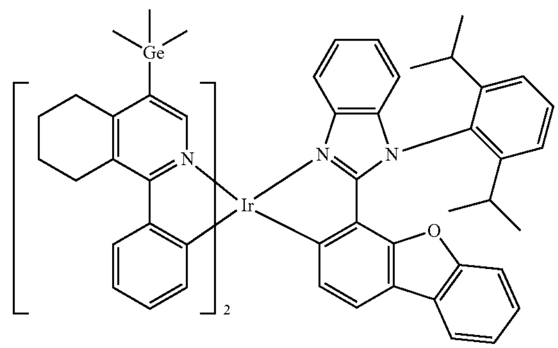
896
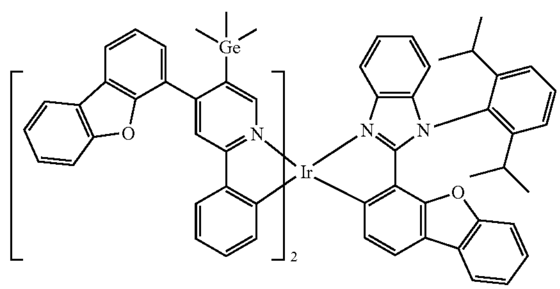
897
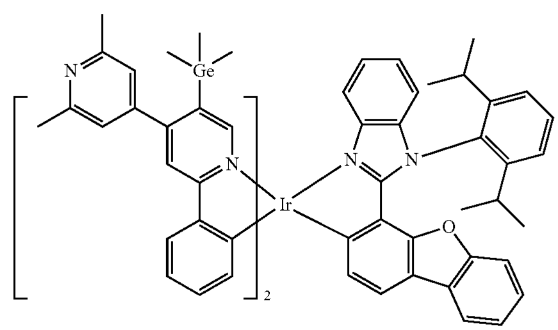
898
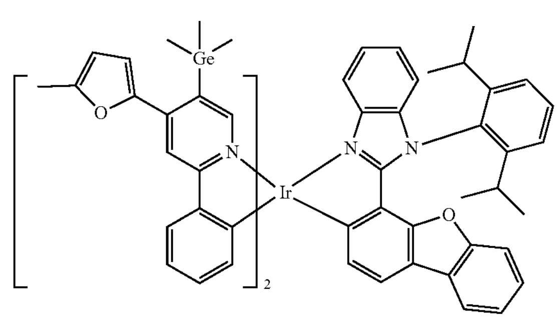

-continued
899
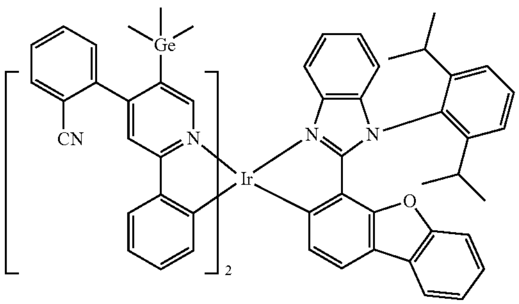
900
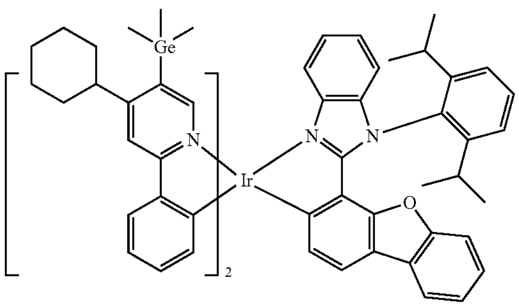
901
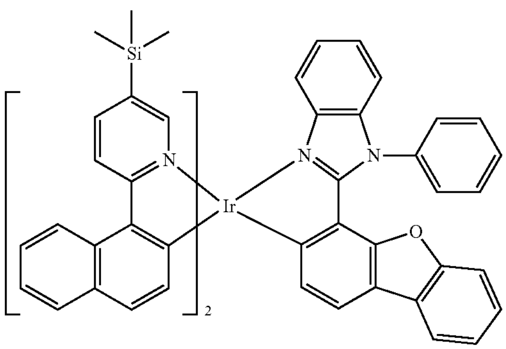
902
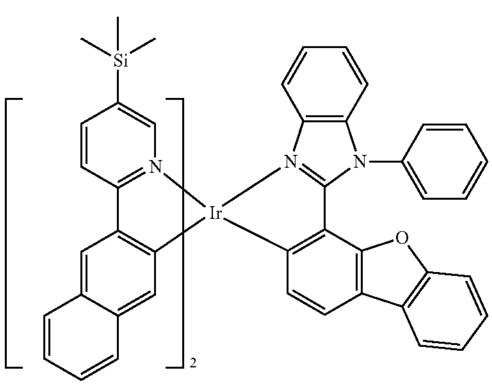
-continued
903
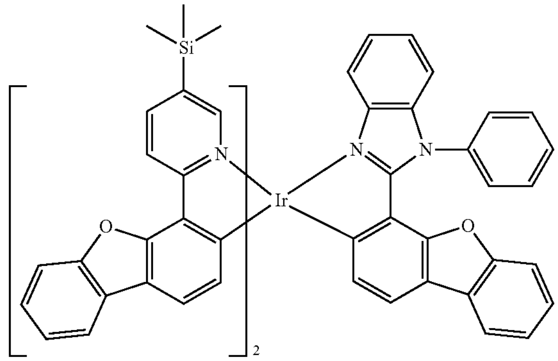
904
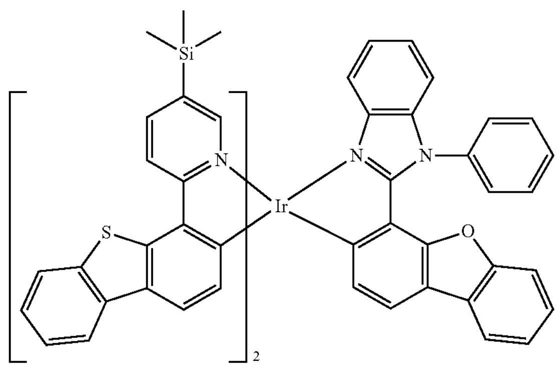
905
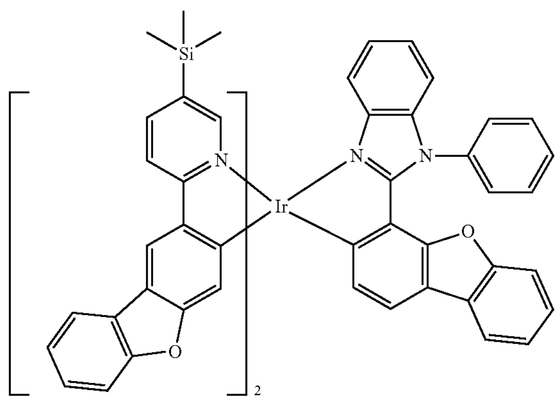
906
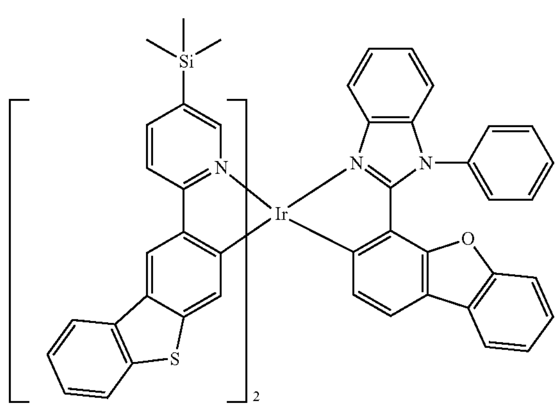

-continued
907
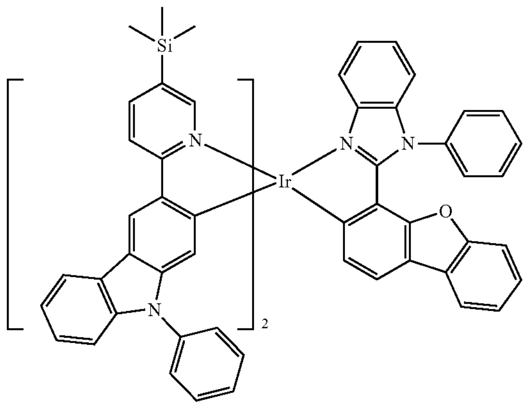
908
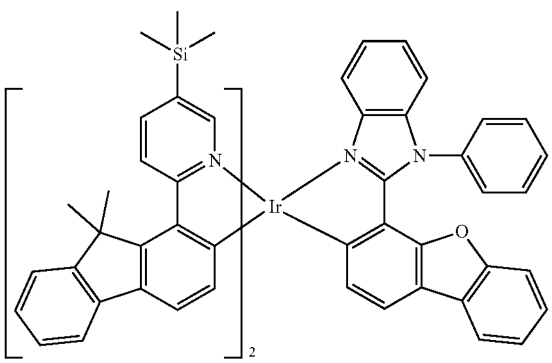
909
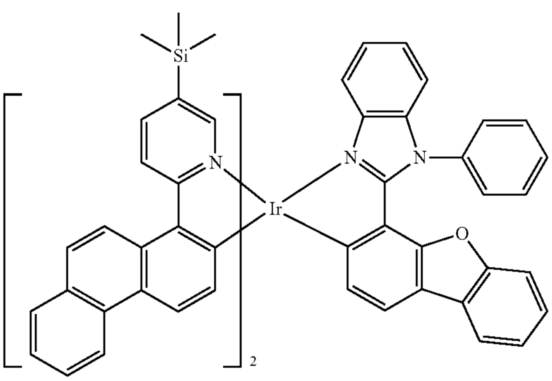
910
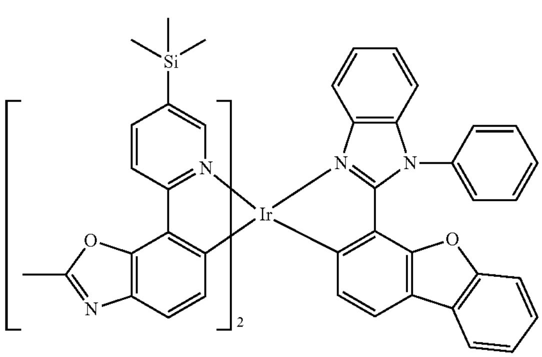
-continued
911
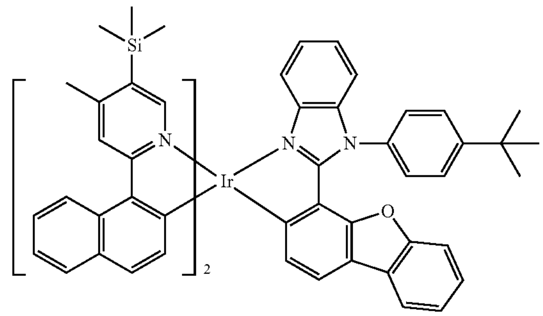
912
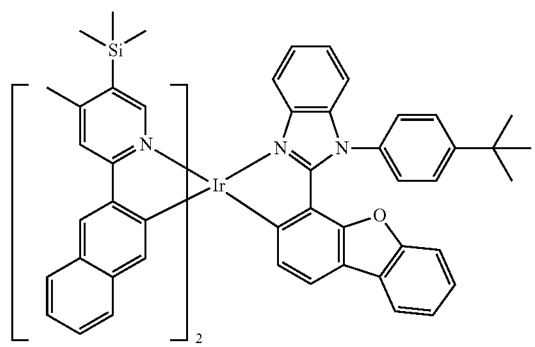
913
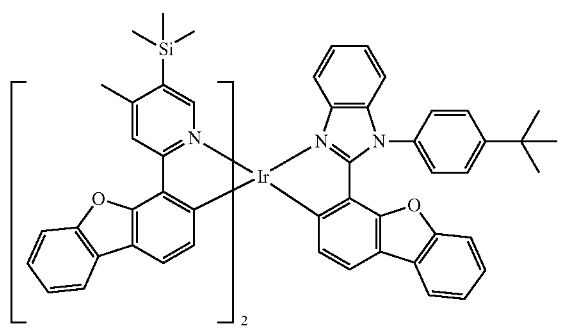
914
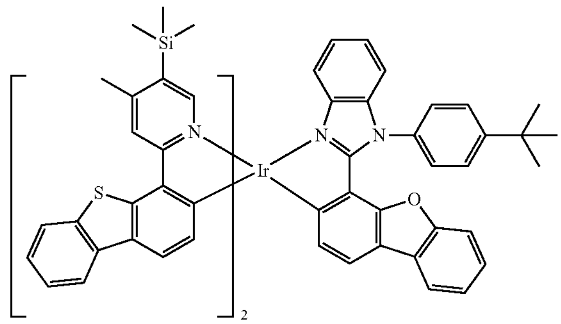

-continued
915
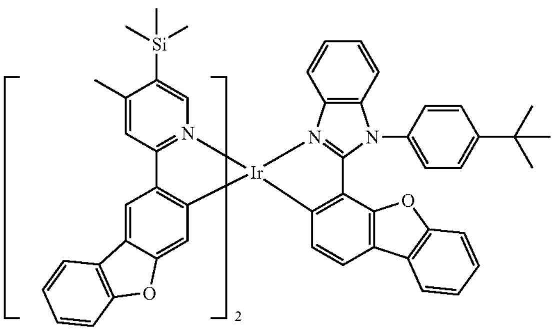
916
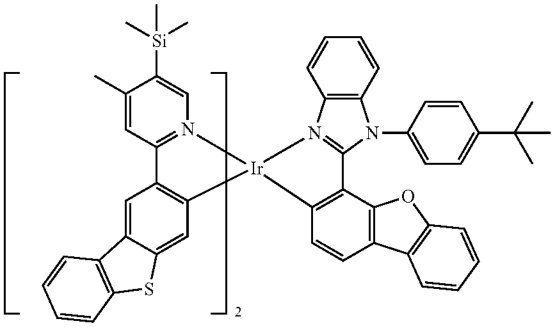
917
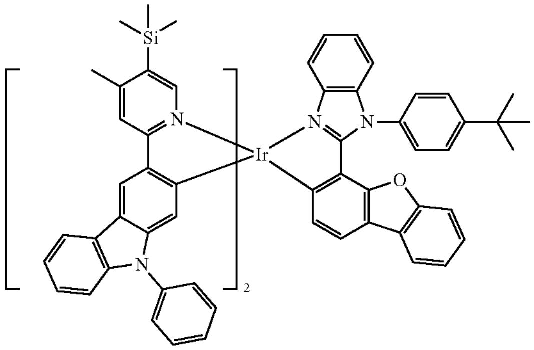
918
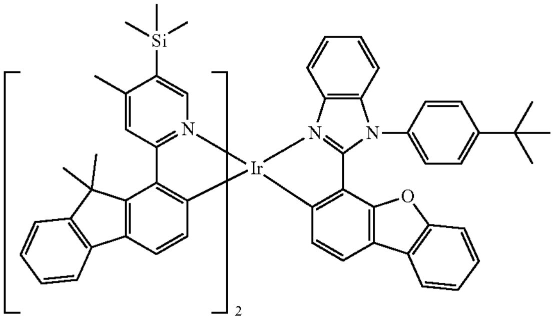
-continued
919
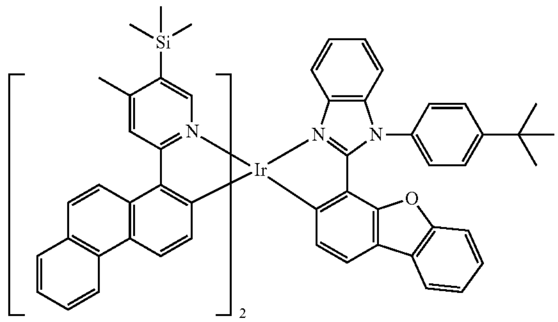
920
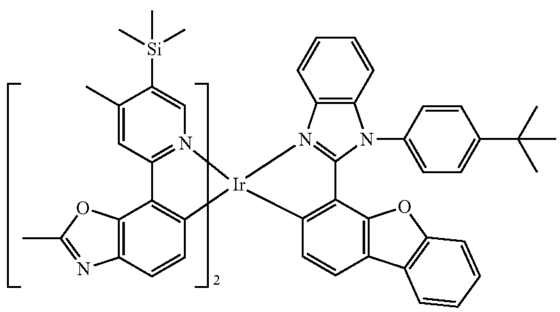
921
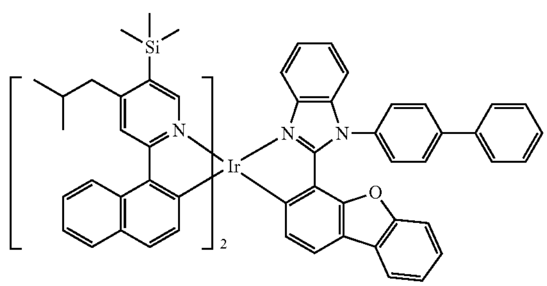
922
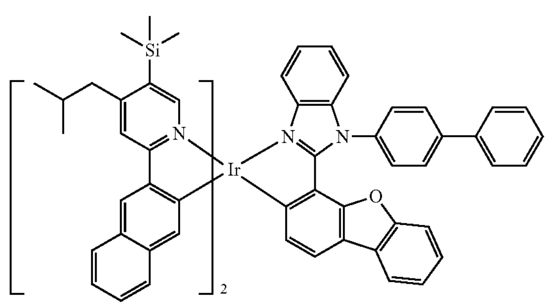
923
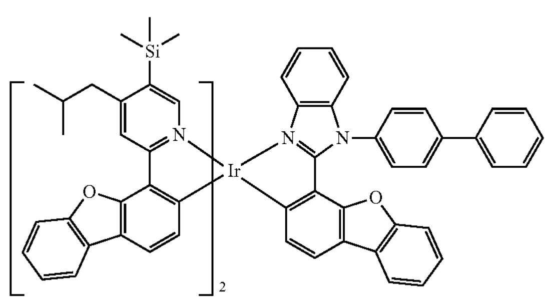

-continued
924
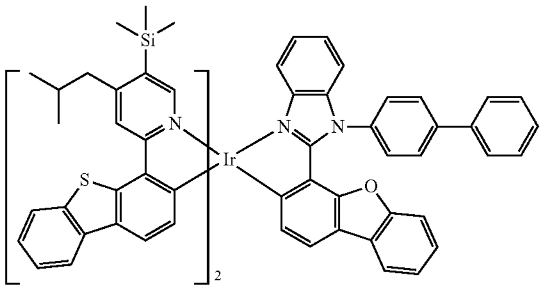
925
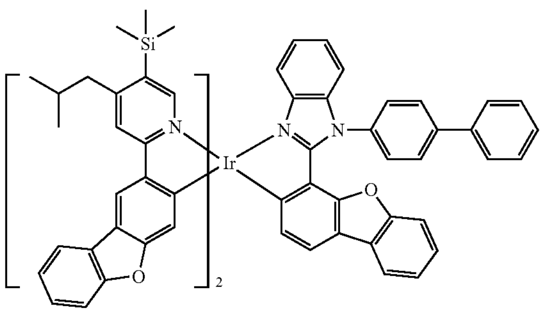
926
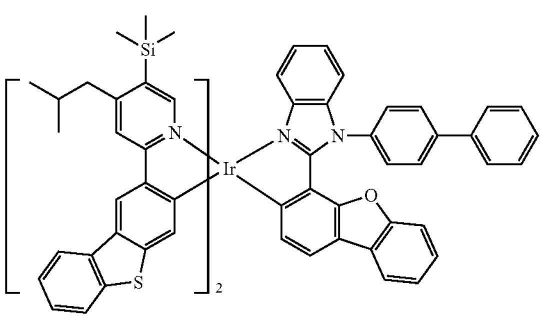
927
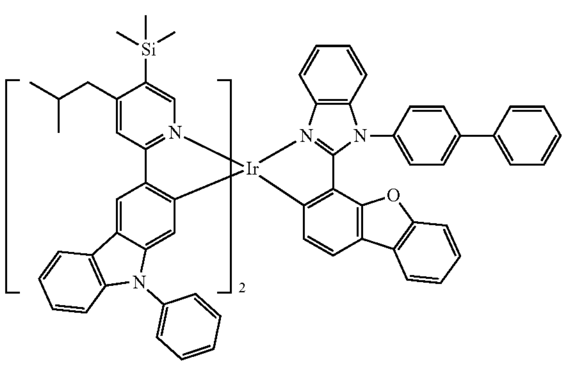
-continued
928
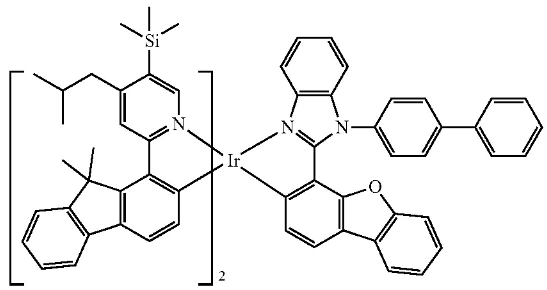
929
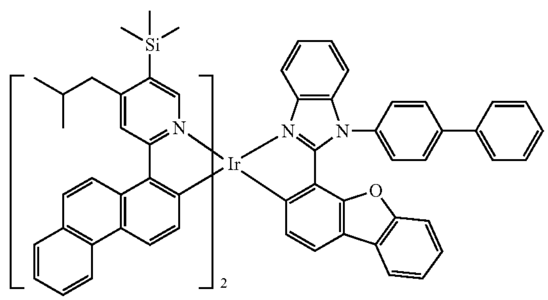
930
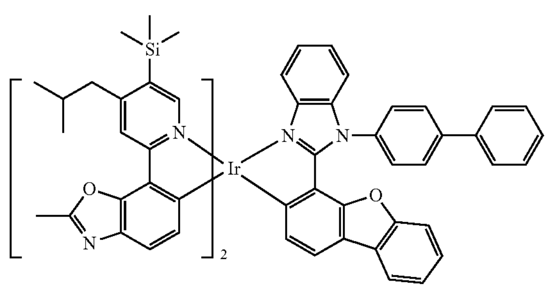
931
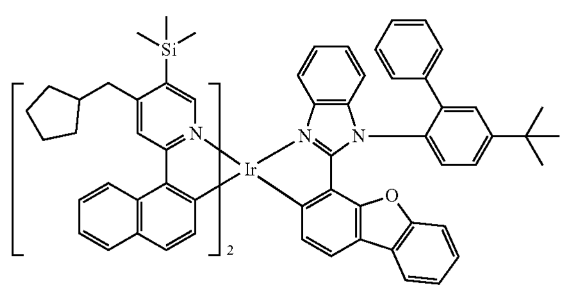
932
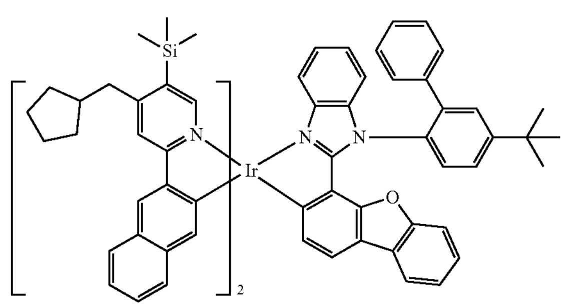

933
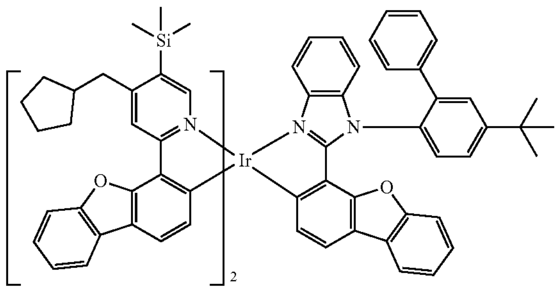
934
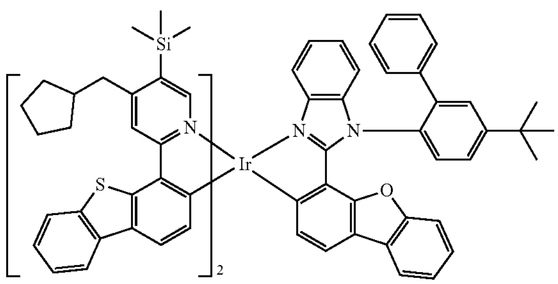
935
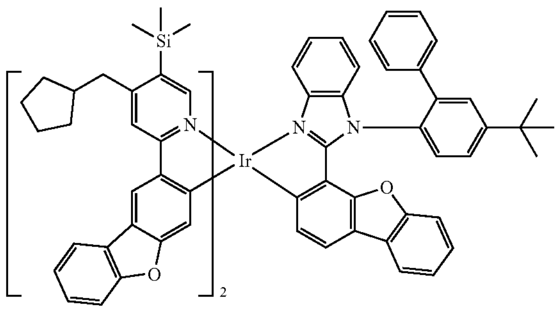
936
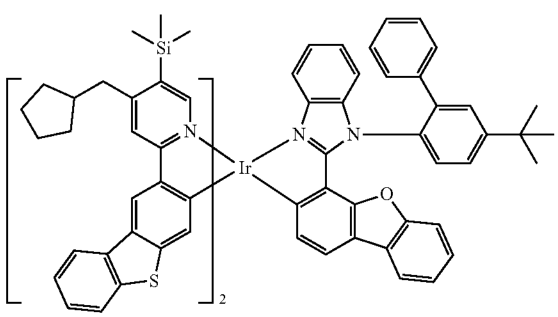
937
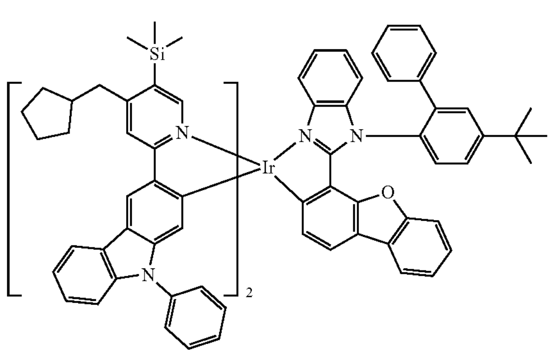
938
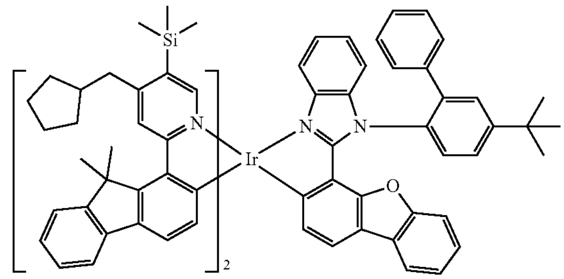
939
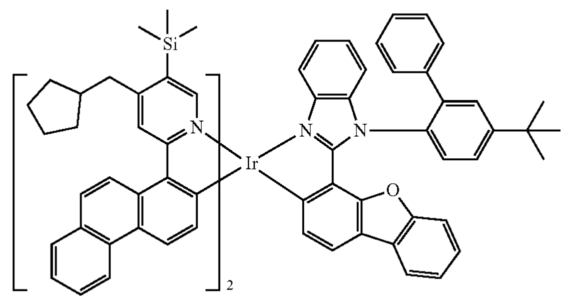
940
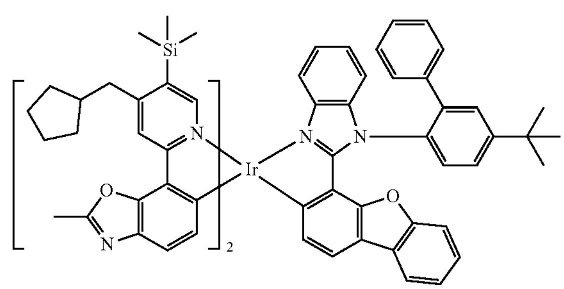
941
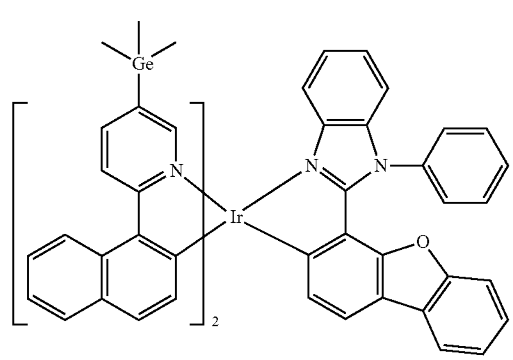

-continued
942
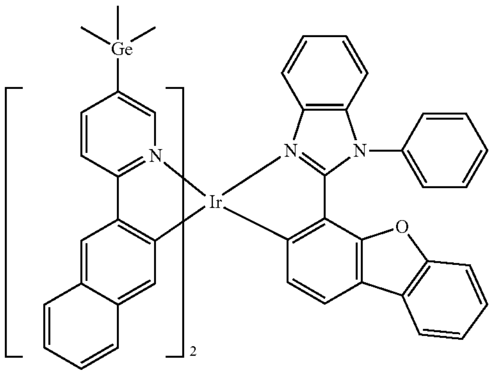
943
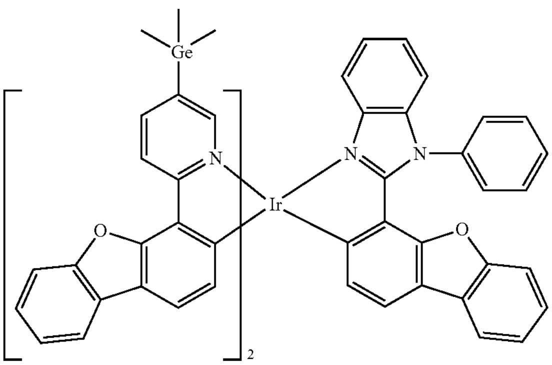
944
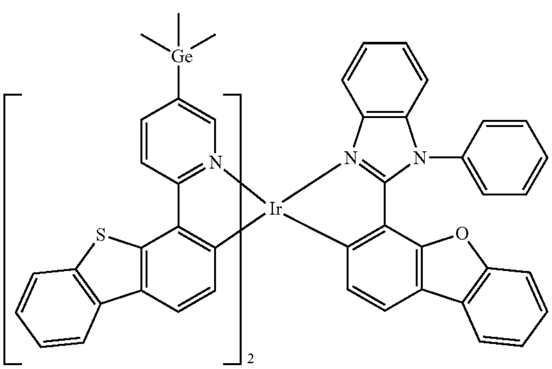
945
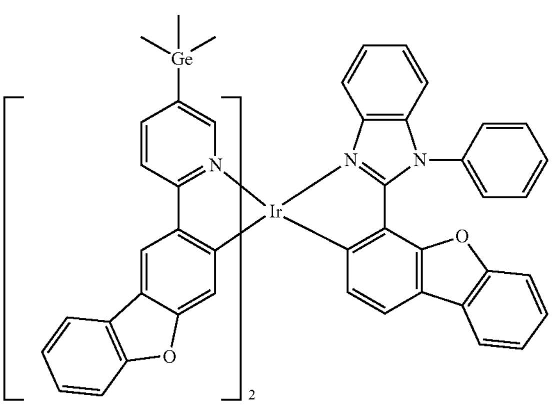
-continued
946
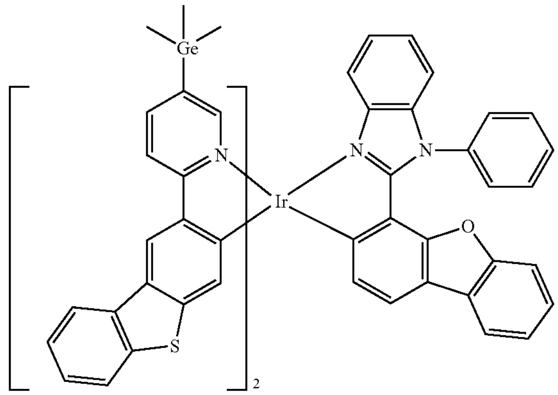
947
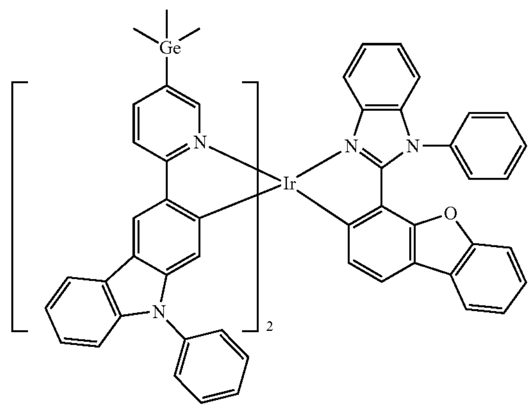
948
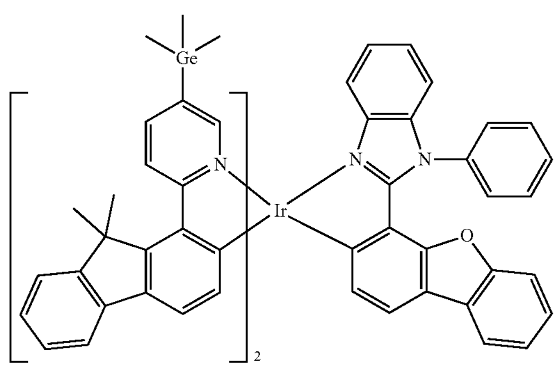
949
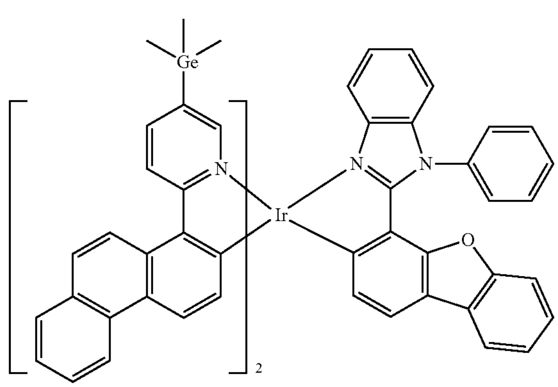

-continued
950
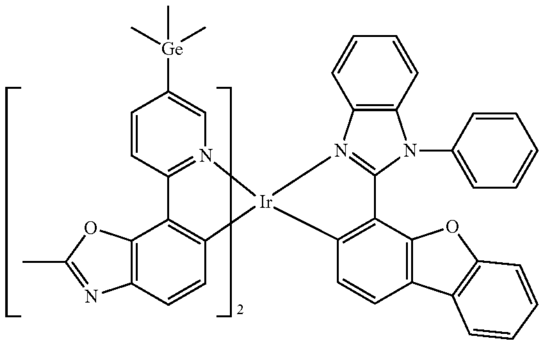
951
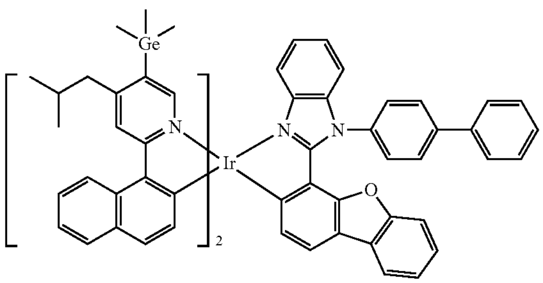
952
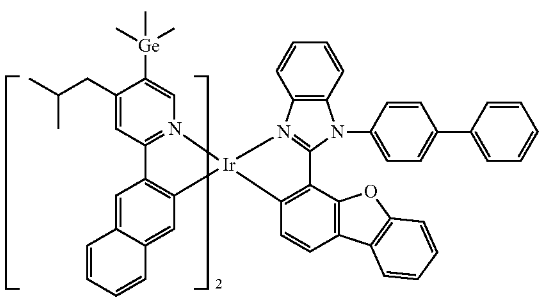
953
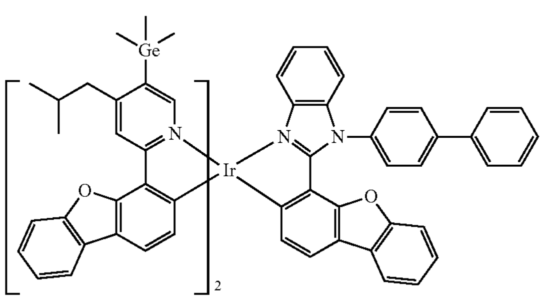
954
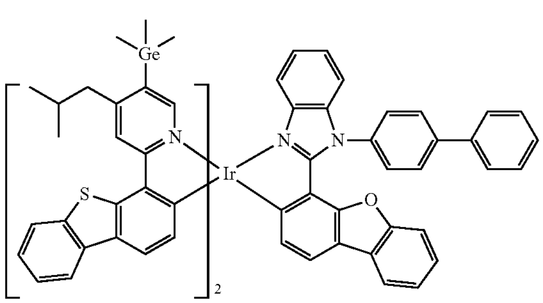
-continued
955
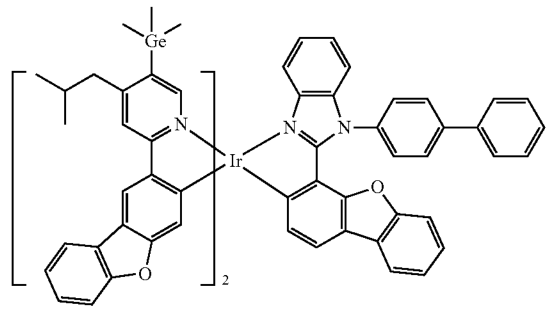
956
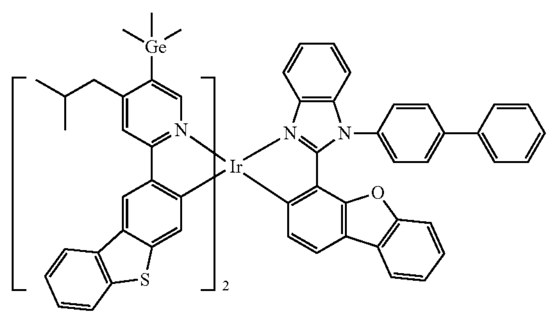
957
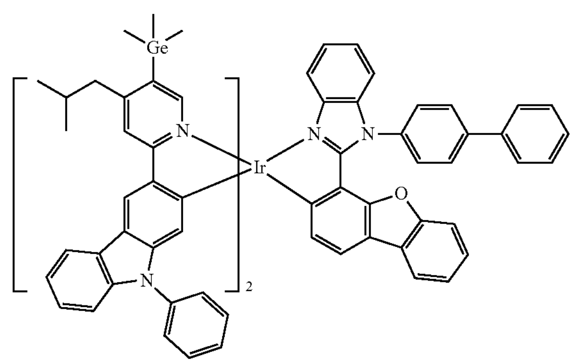
958
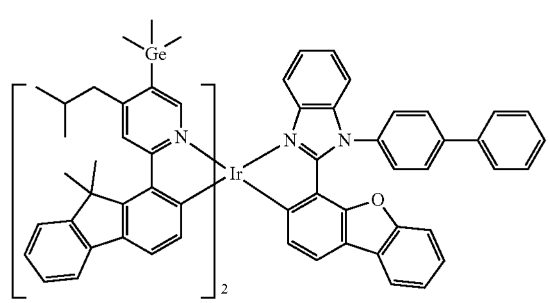

959
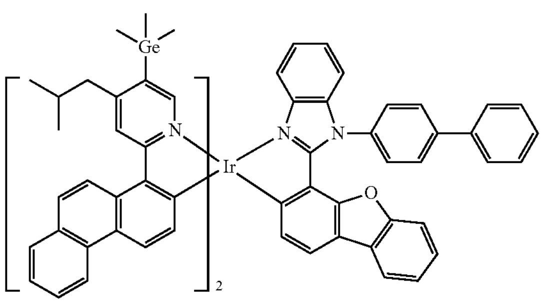
960
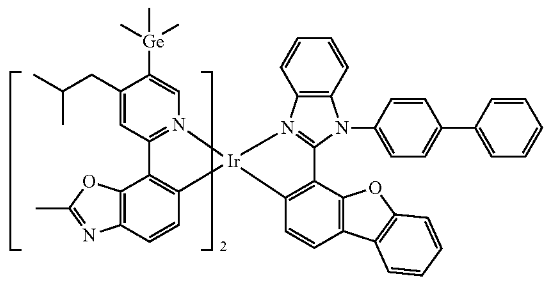
961
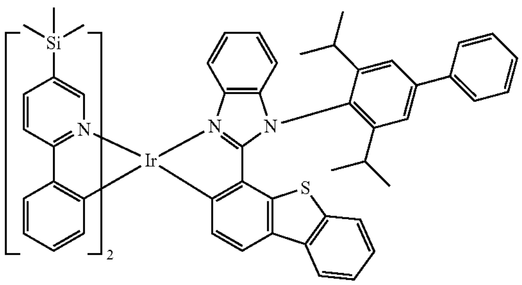
962
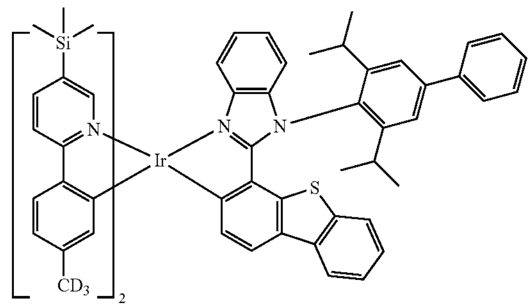
963
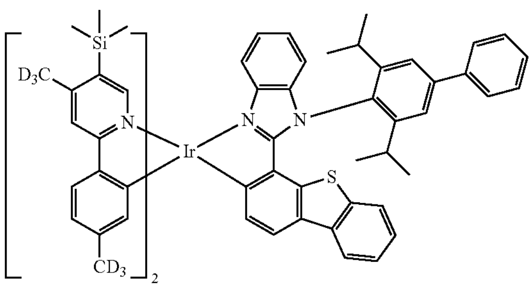
964
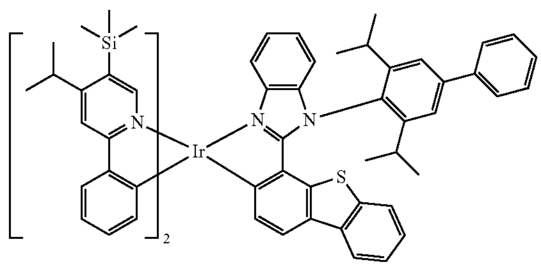
965
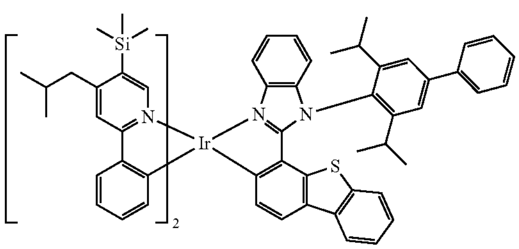
966
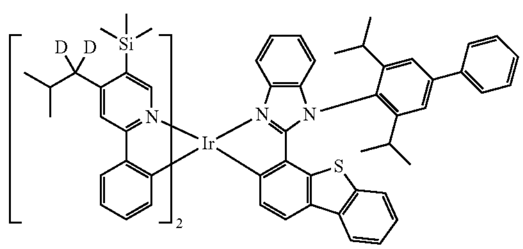
967
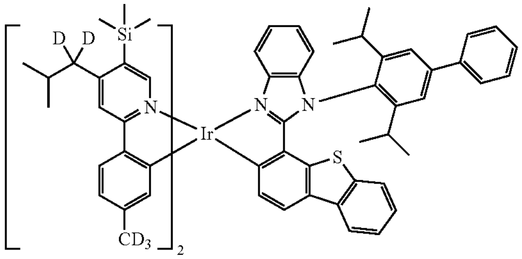
968
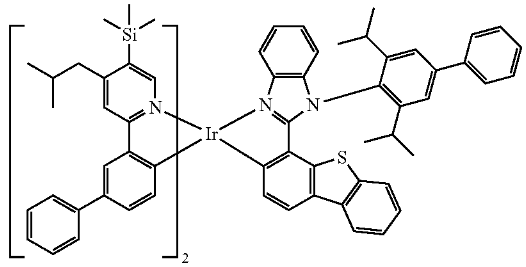

-continued
969
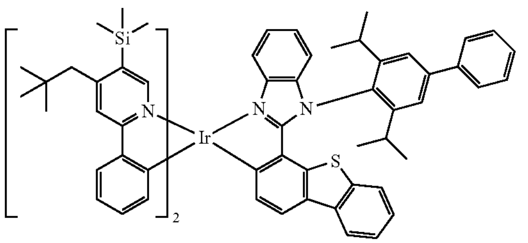
970
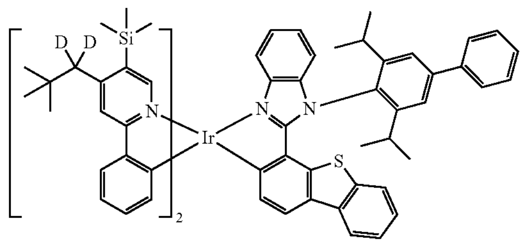
971
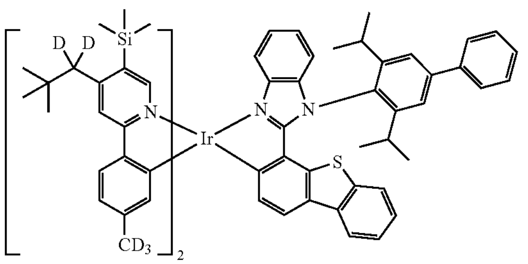
972
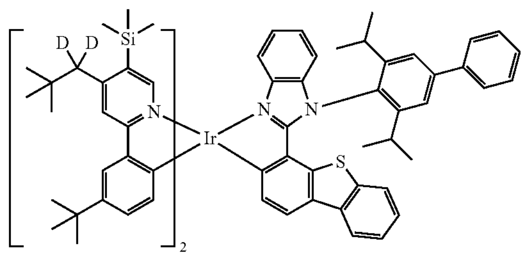
973
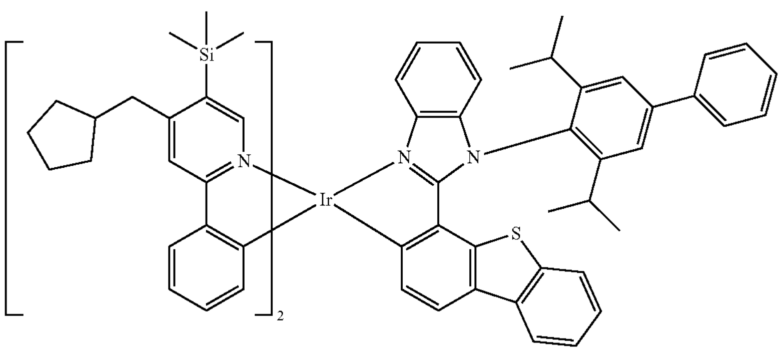
974
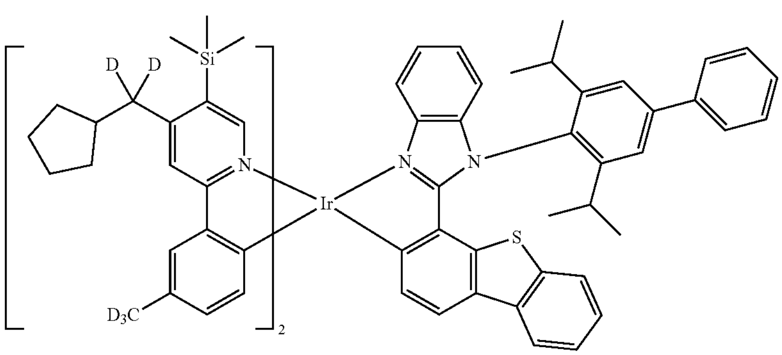
975
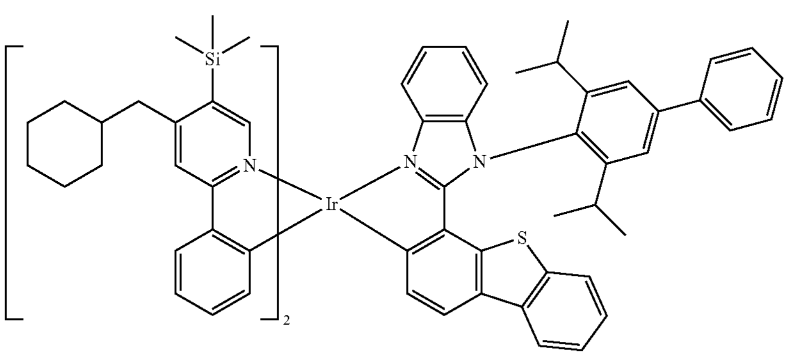

-continued
976
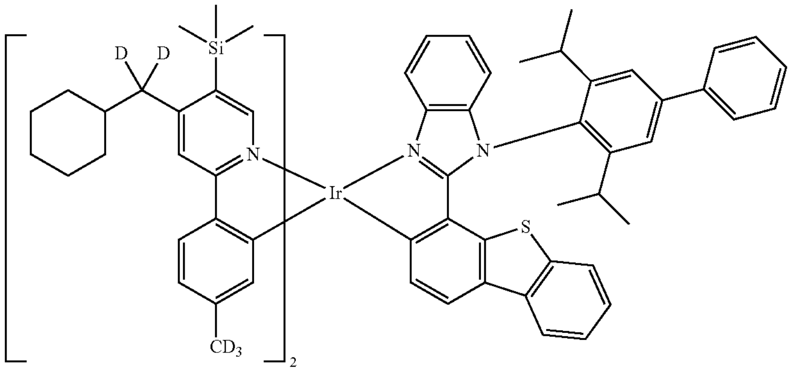
977
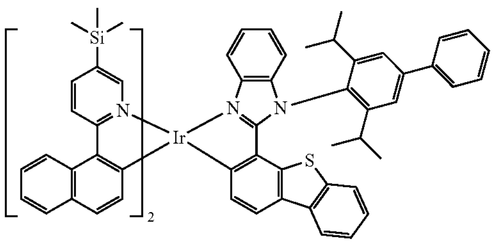
978
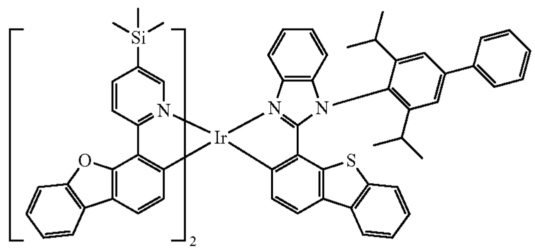
979
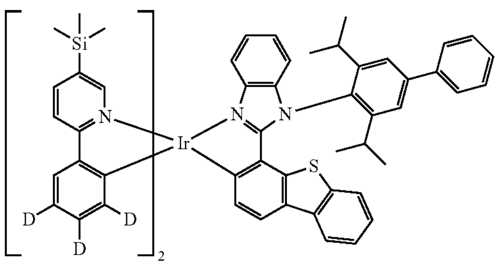
980
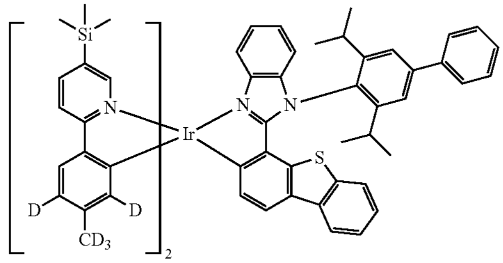
981
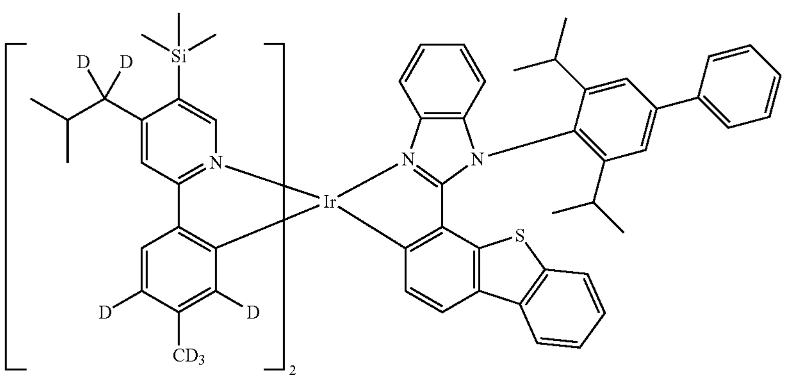
982
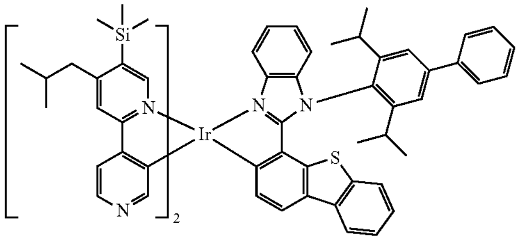
983
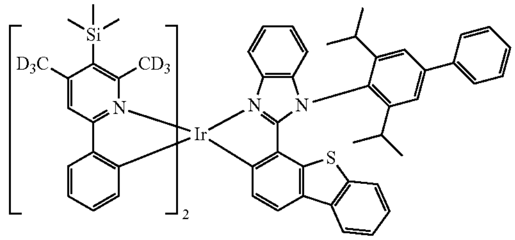

-continued
984
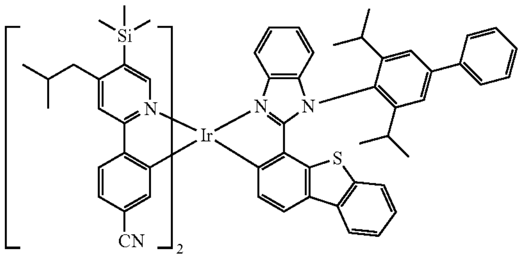
985
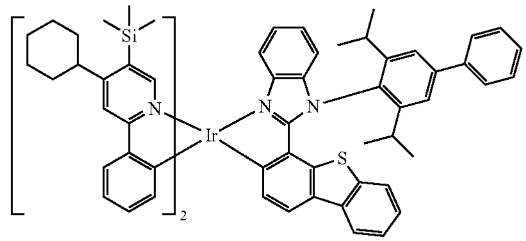
986
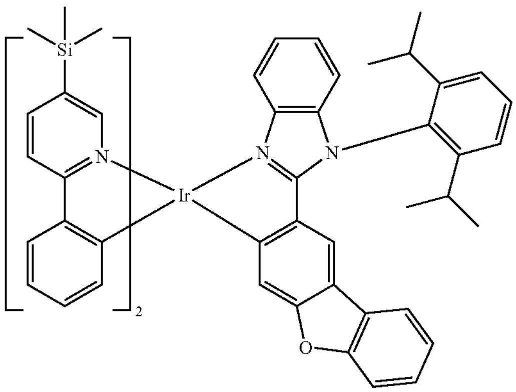
987
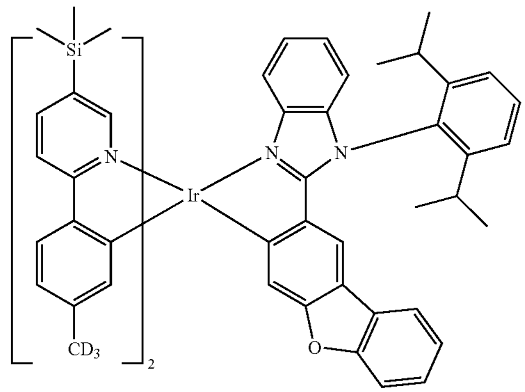
988
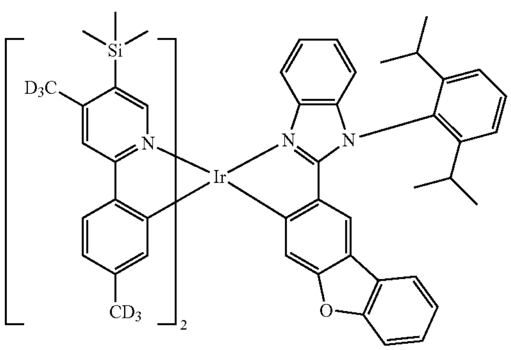
989
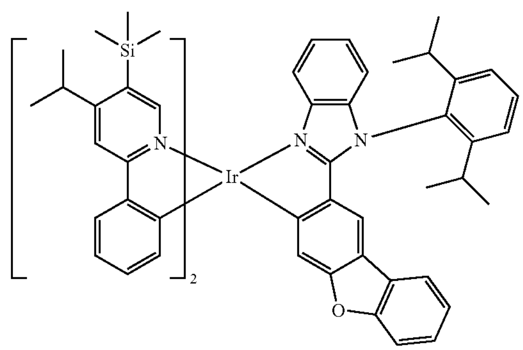
990
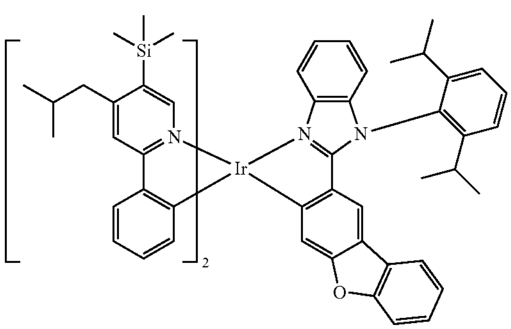
991
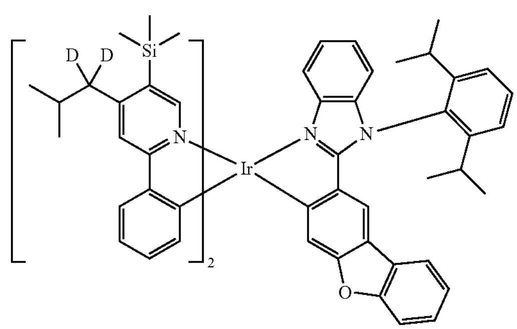
992
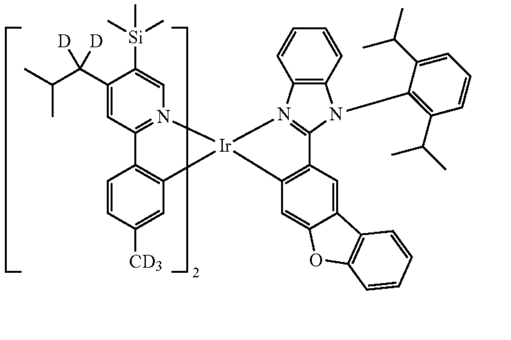
993
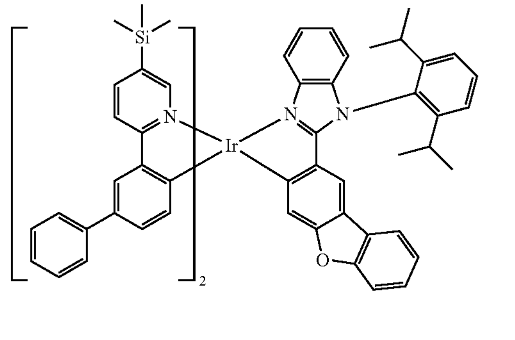

-continued
994
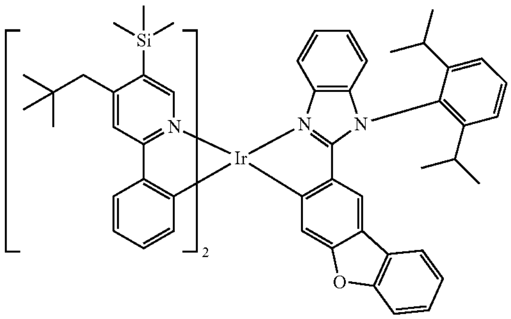
995
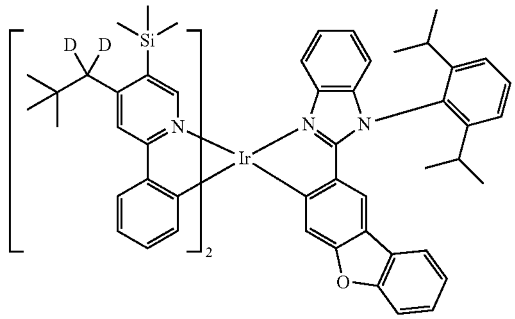
996
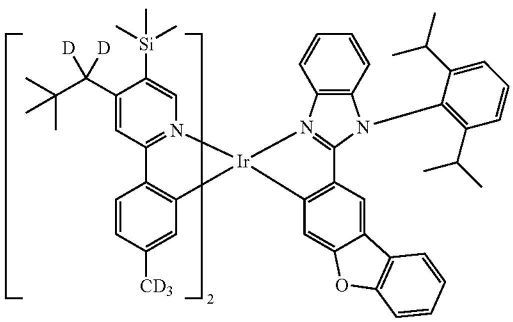
997
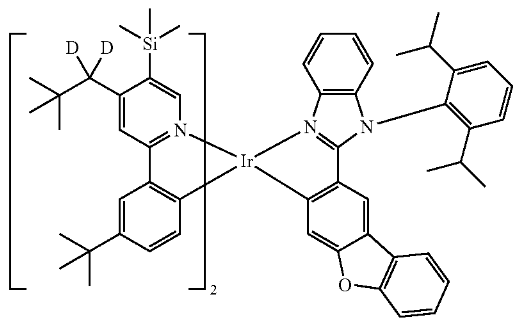
998
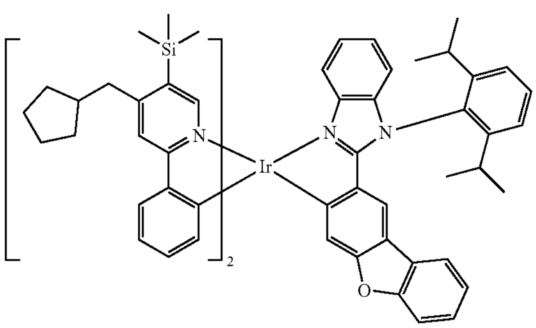
999
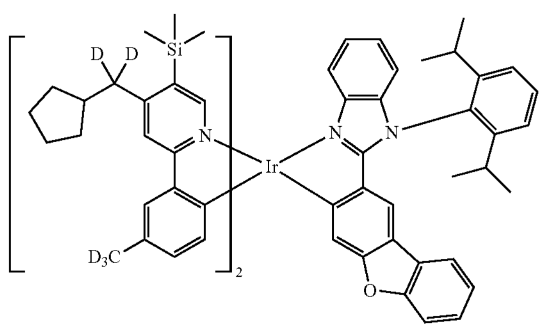
1000
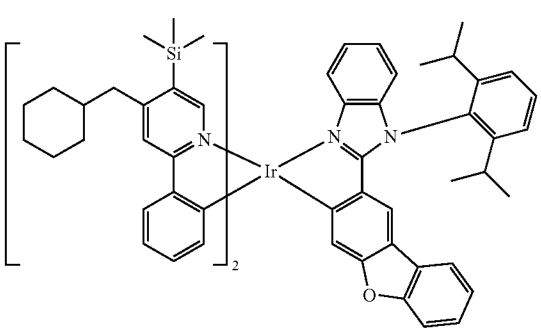
1001
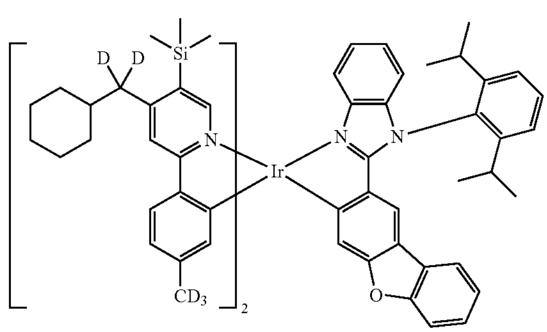

-continued
1002
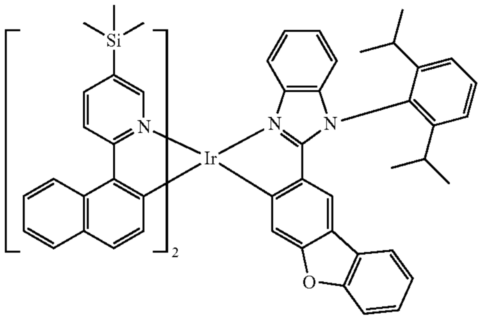
1003
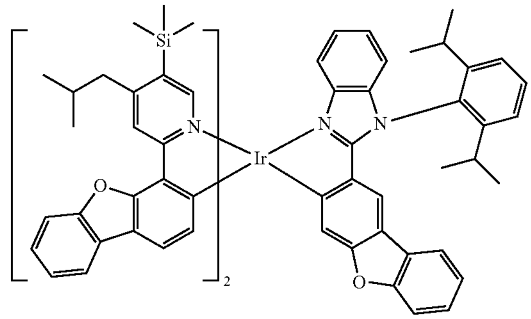
1004
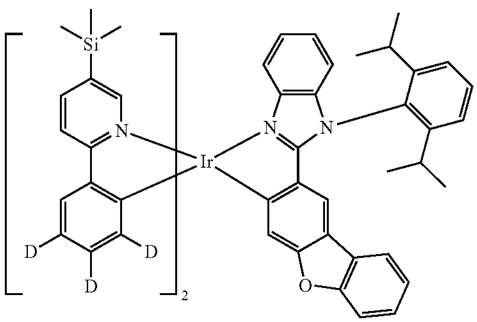
1005
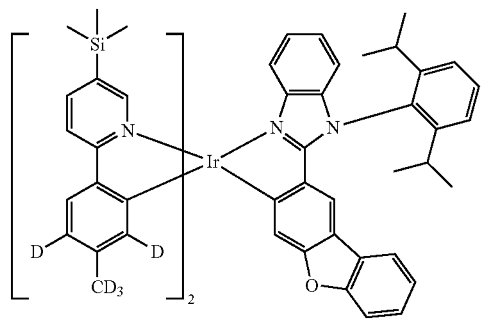
1006
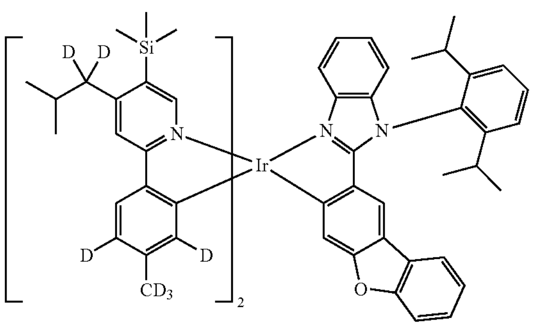
1007
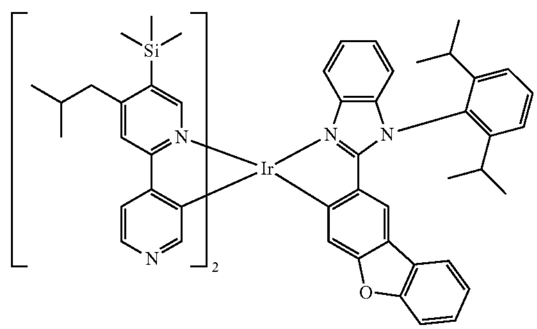
1008
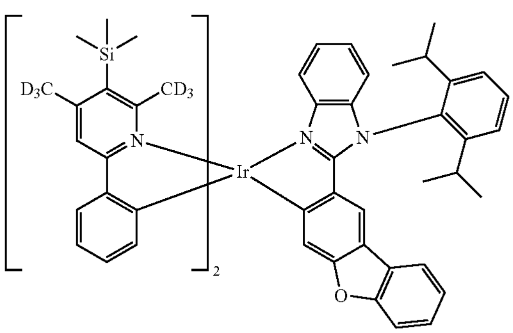
1009
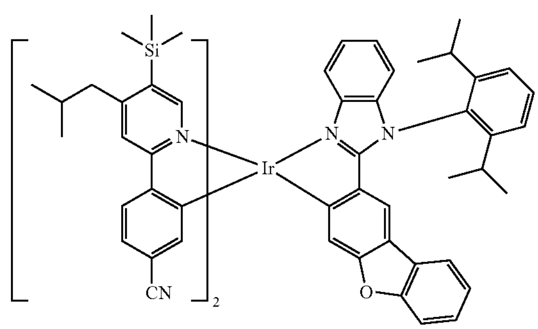

-continued
1010
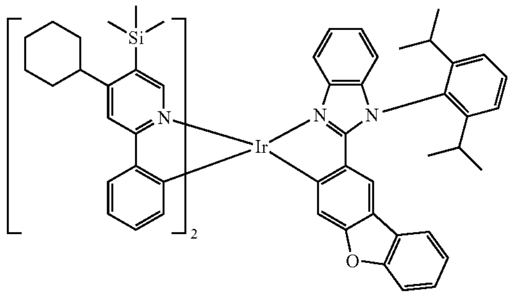
1011
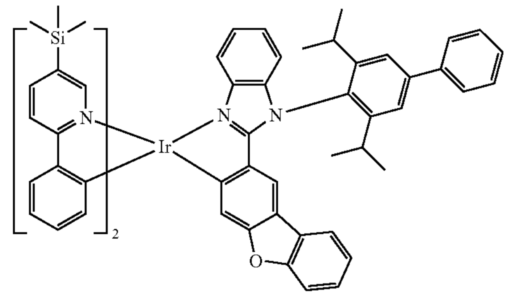
1012
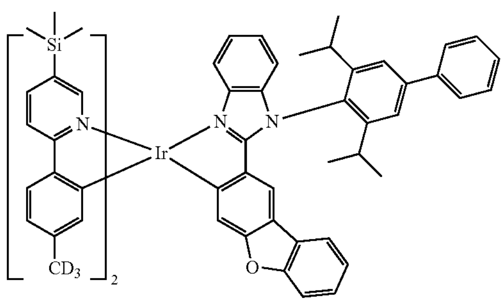
1013
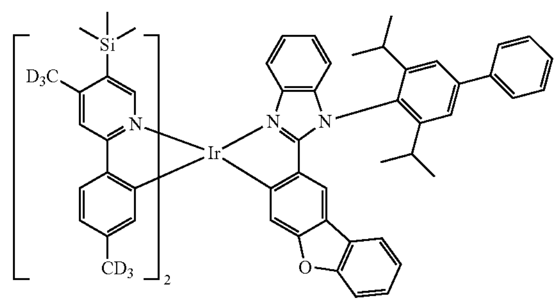
1014
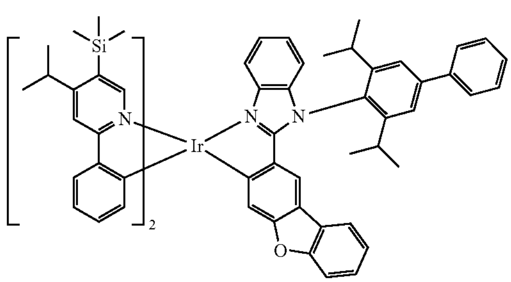
1015
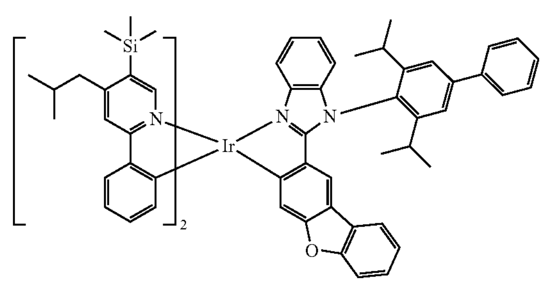
1016
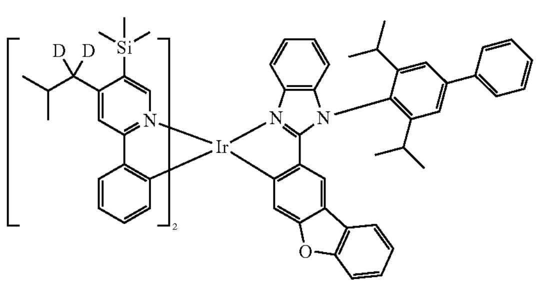
1017
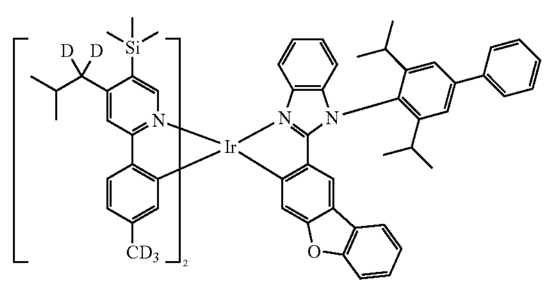
1018
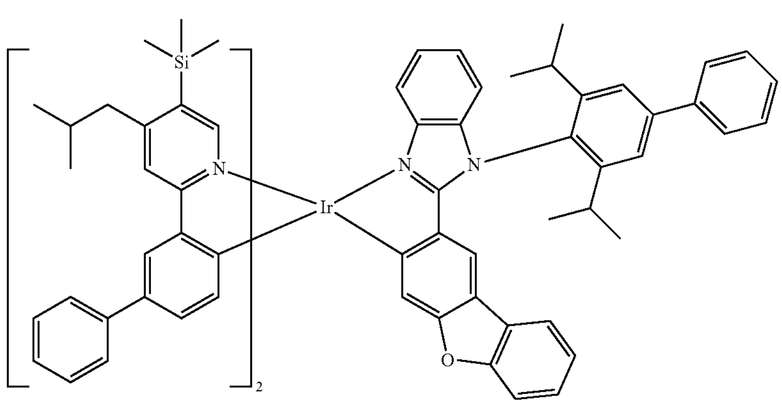

-continued
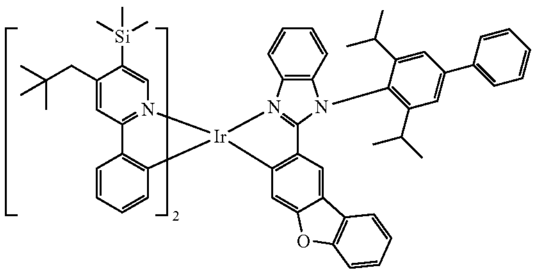
1019
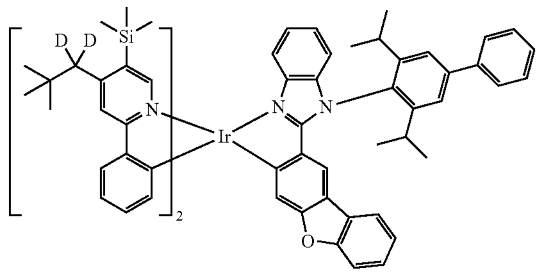
1020
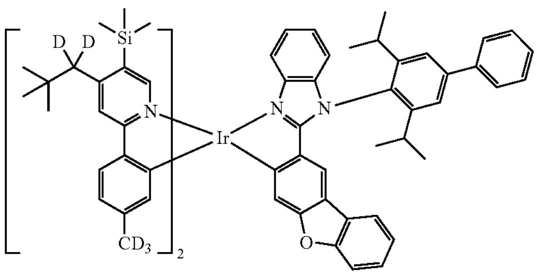
1021
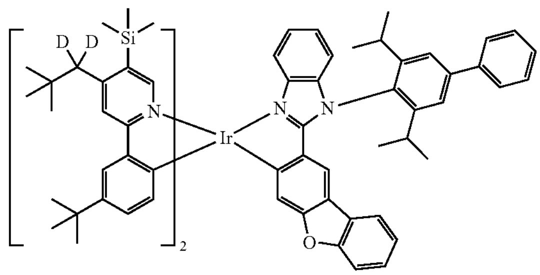
1022
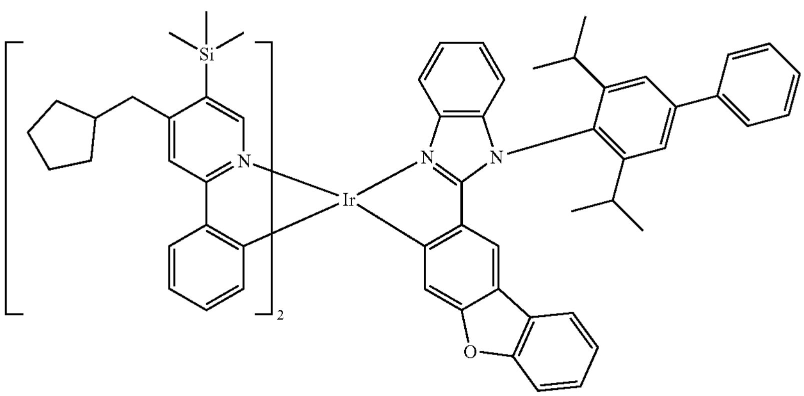
1023
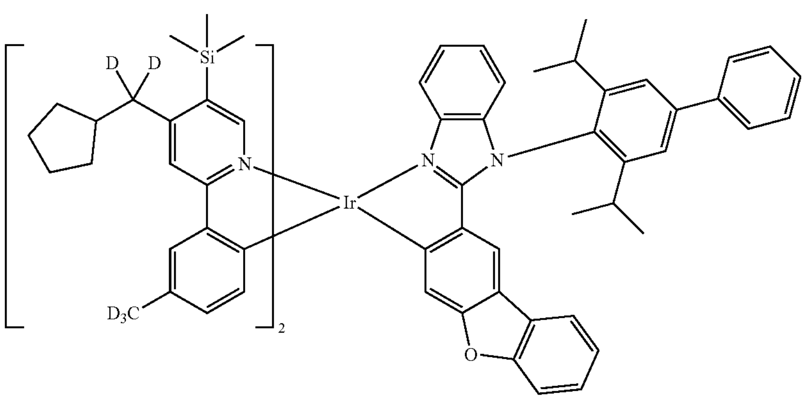
1024

-continued
1025
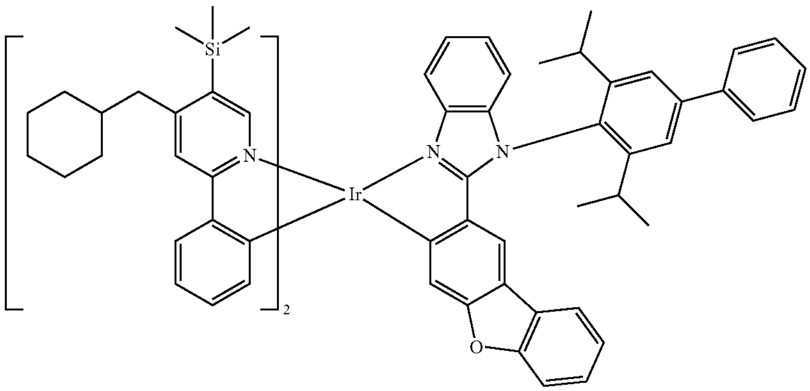
1026
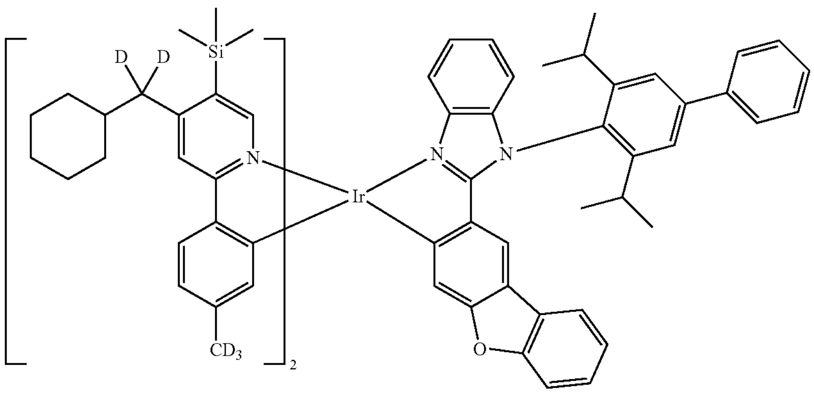
1027
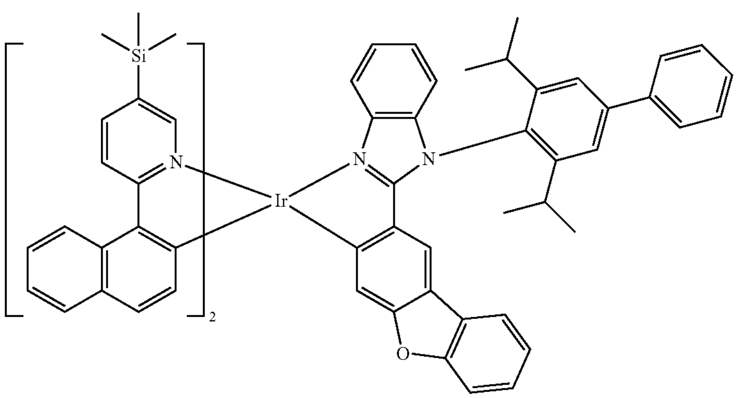
1028
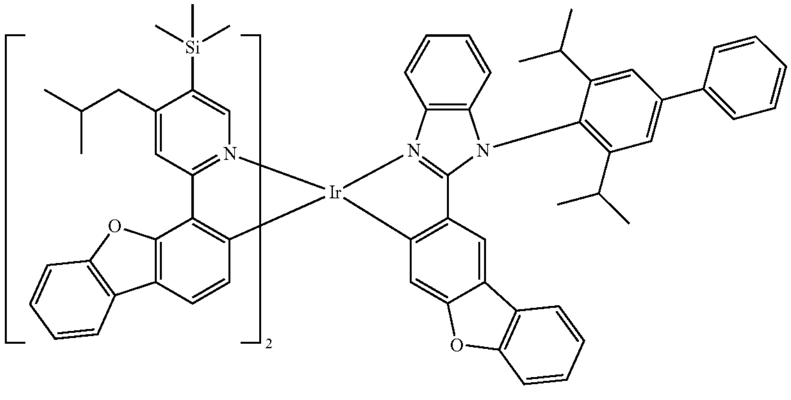

-continued
1029
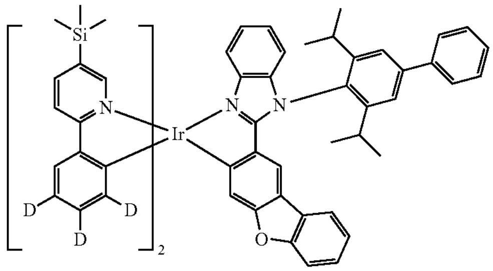
1030
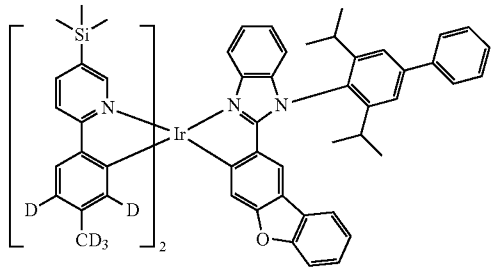
1031
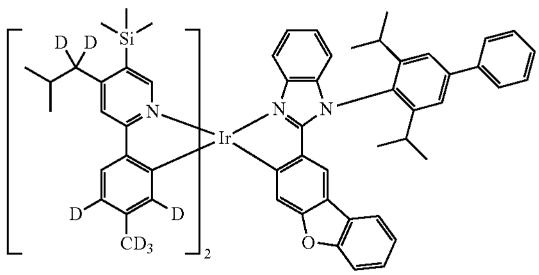
1032
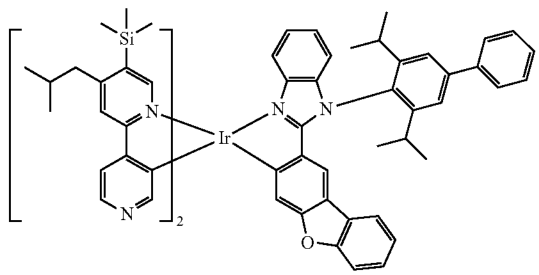
1033
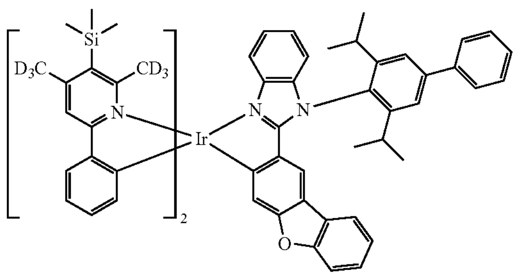
1034
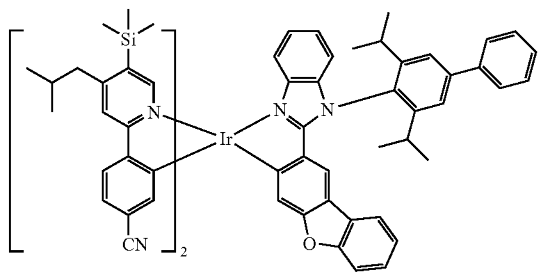
1035
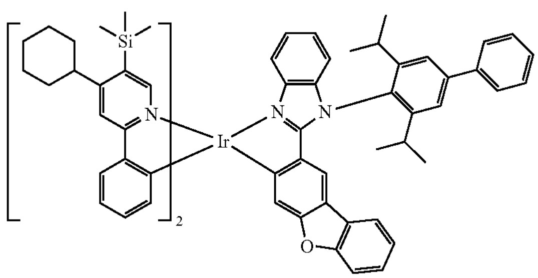
1036
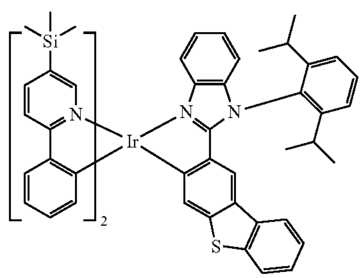
1037
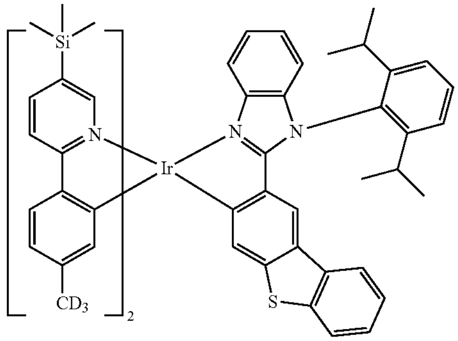
1038
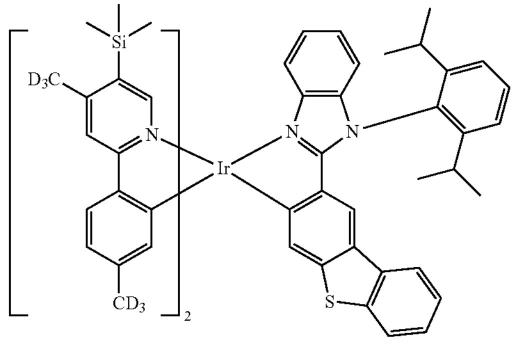

-continued
1039
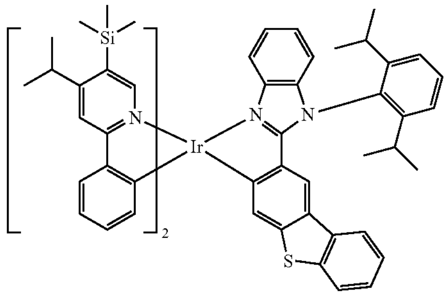
1040
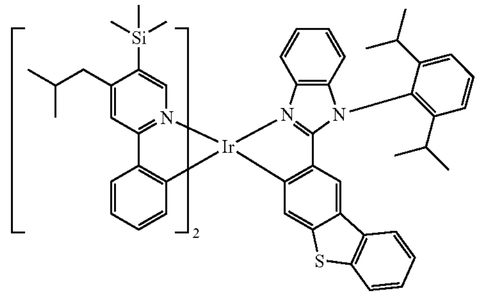
1041
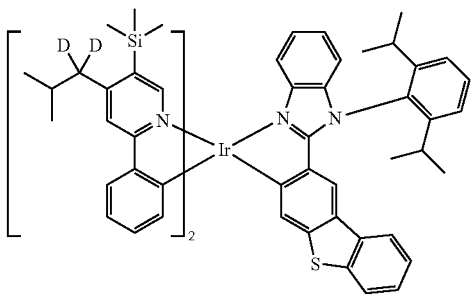
1042
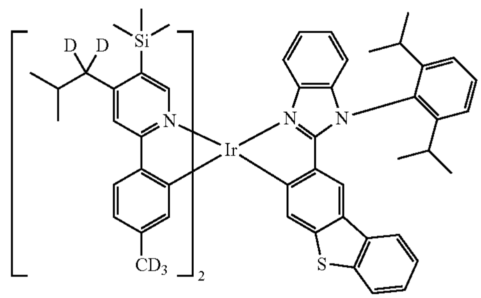
1043
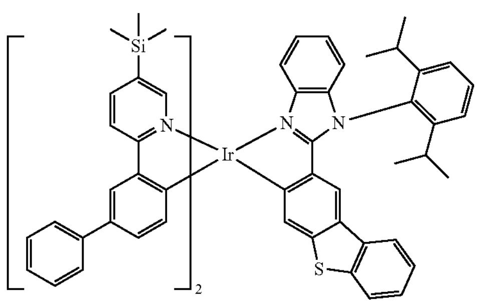
1044
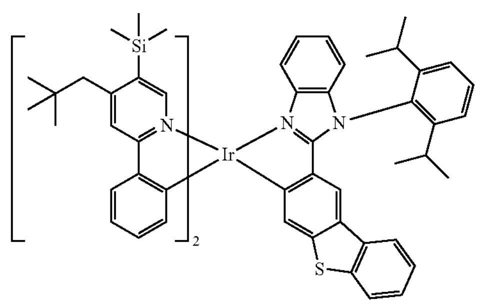
1045
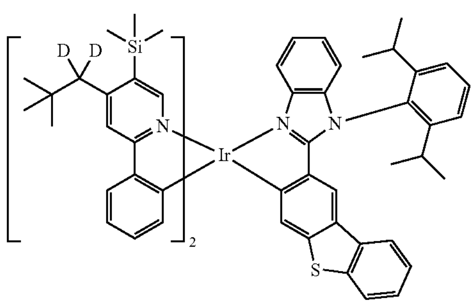
1046
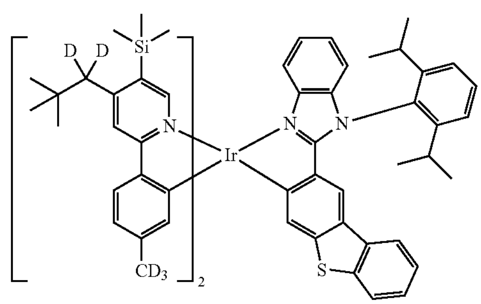
1047
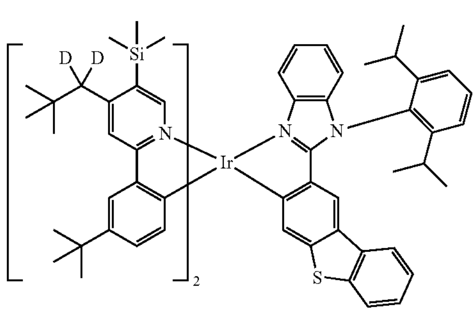
1048
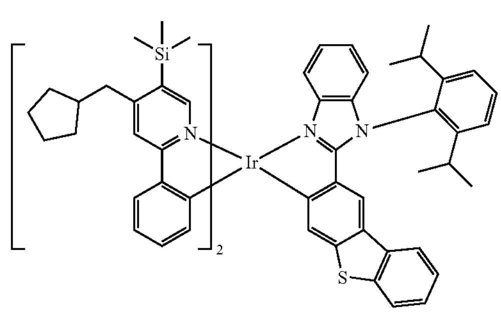

-continued
1049
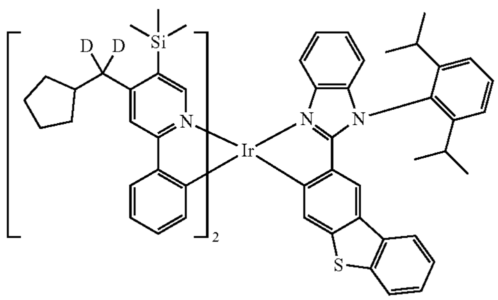
1050
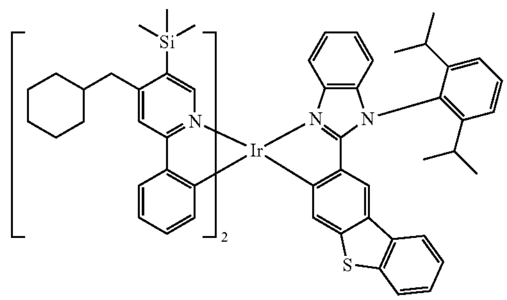
1051
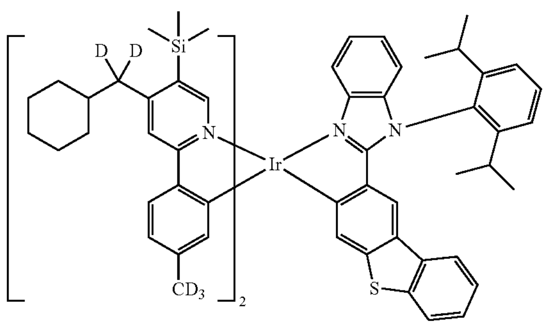
1052
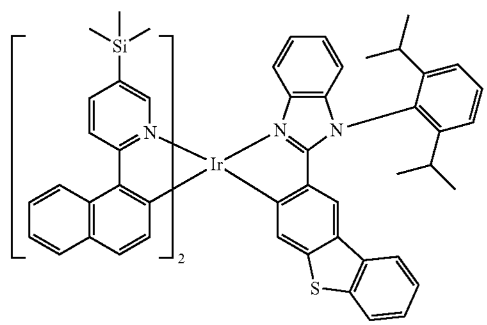
1053
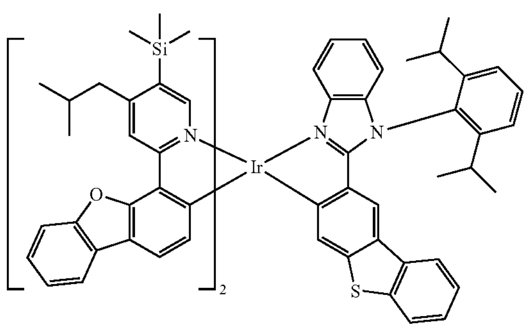
1054
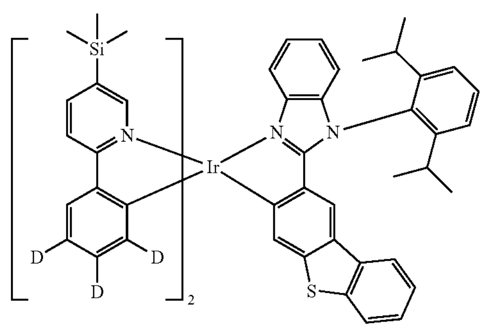
1055
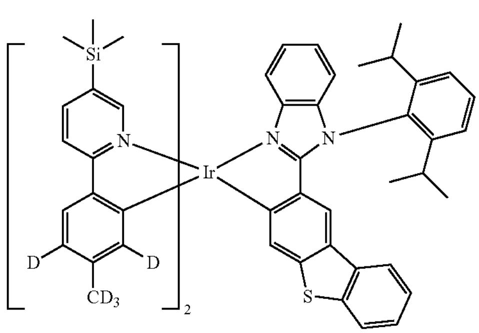
1056
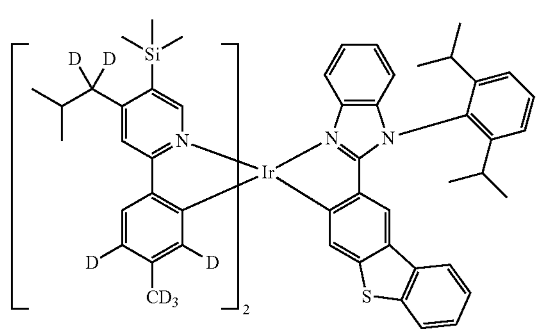

-continued
1057
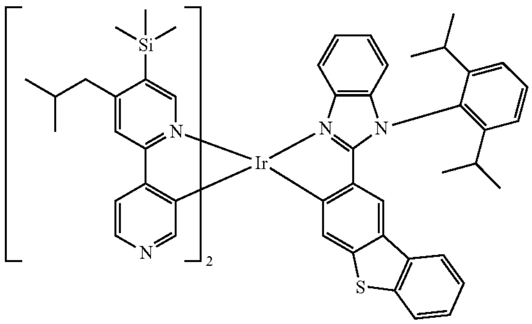
1058
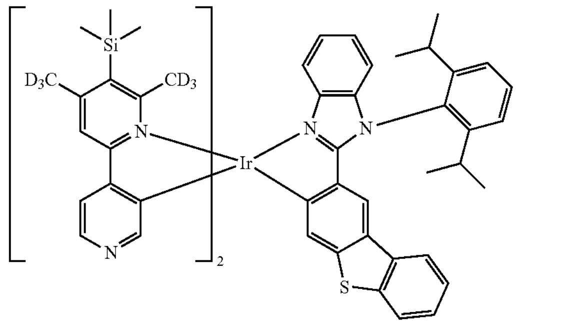
1059
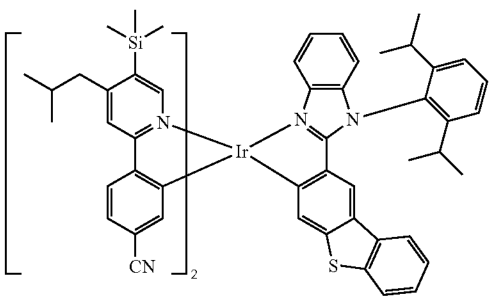
1060
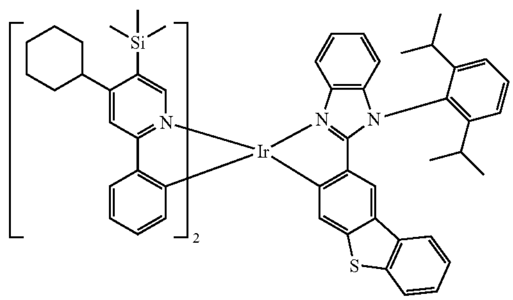
1061
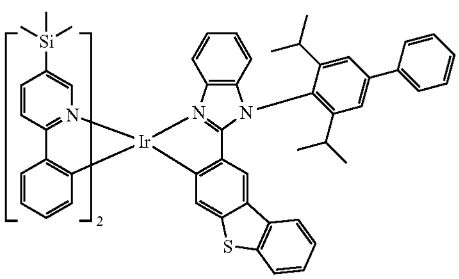
1062
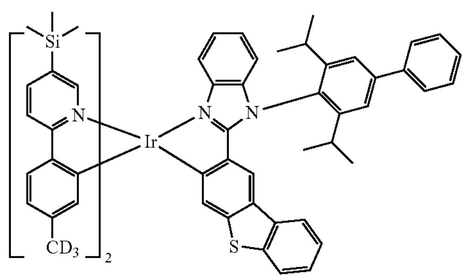
1063
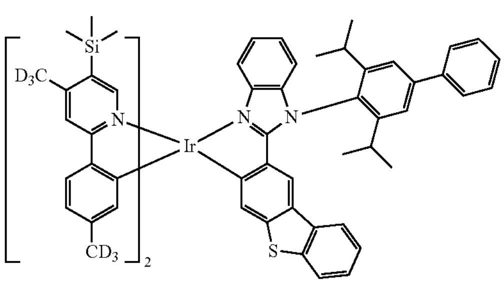
1064
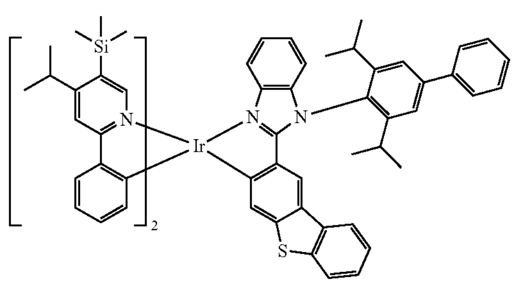
1065
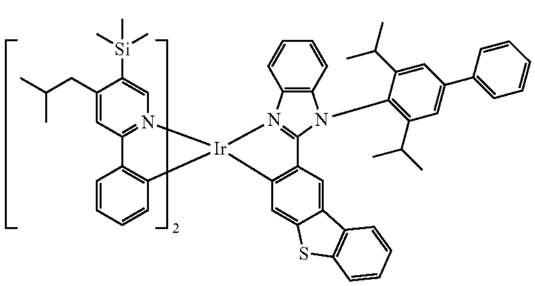
1066
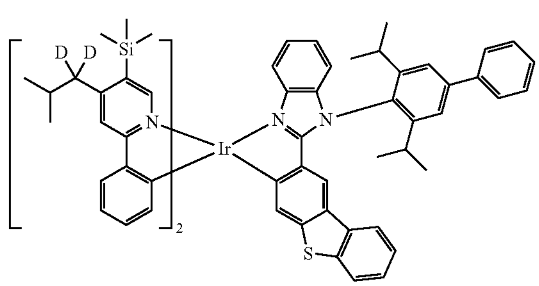

-continued
1067
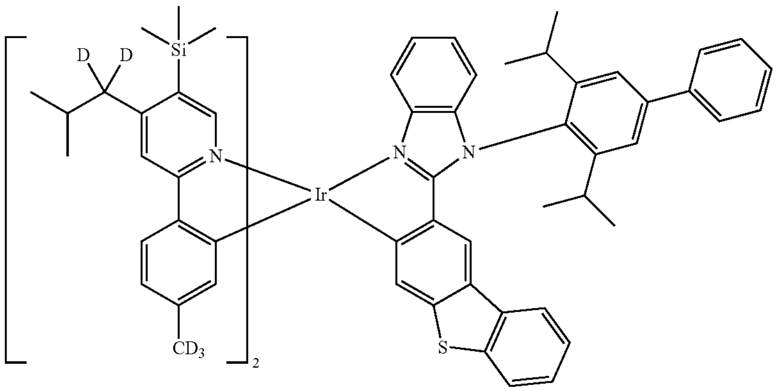
1068
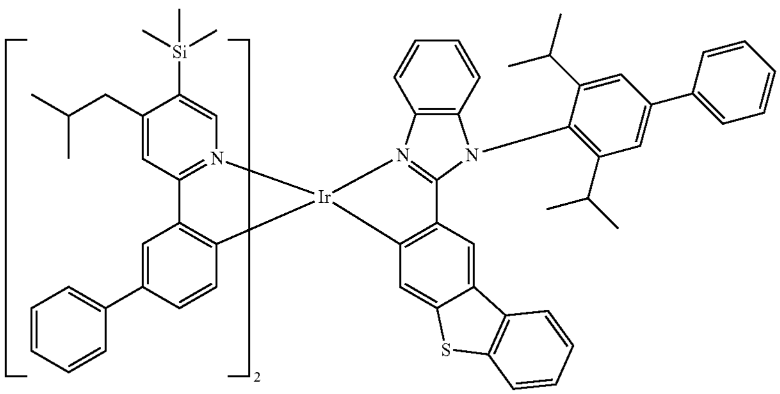
1069
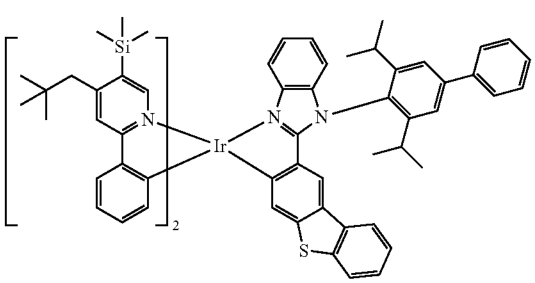
1070
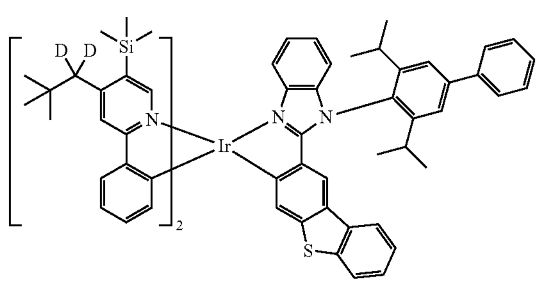
1071
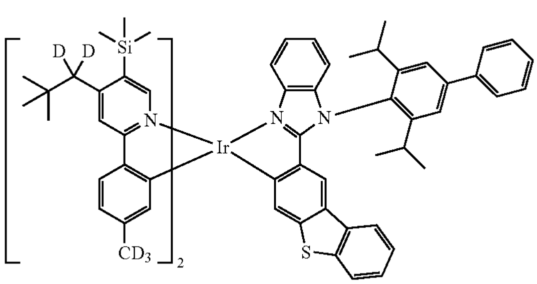
1072
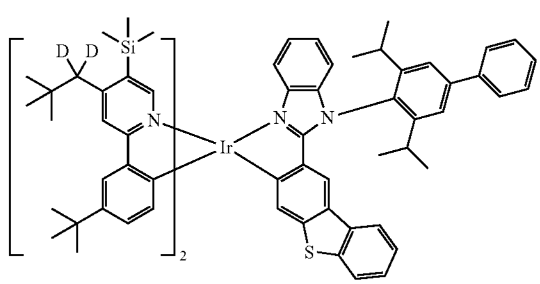

-continued
1073
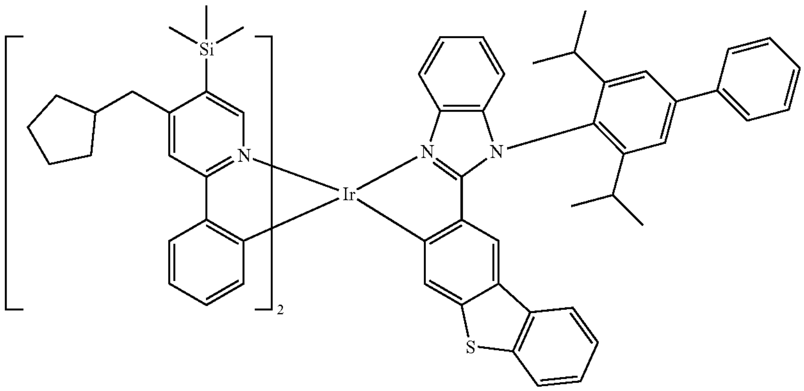
1074
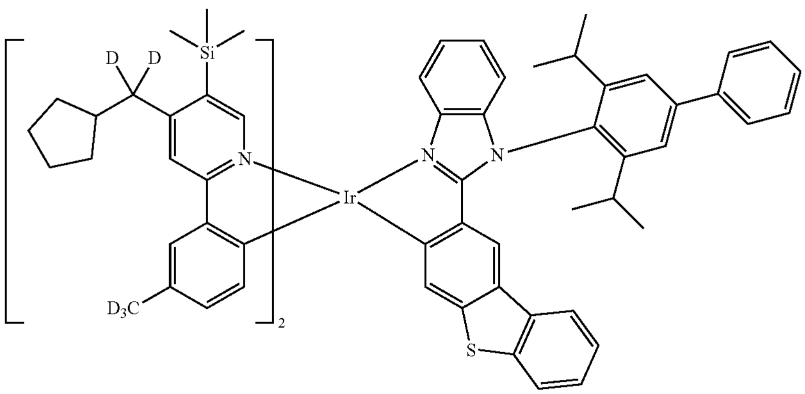
1075
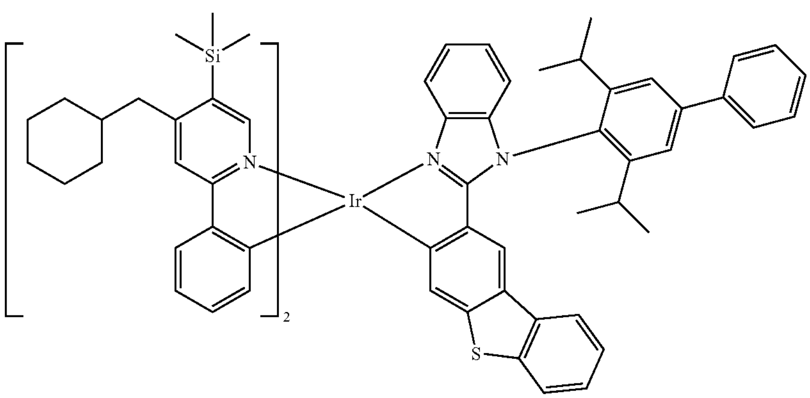
1076
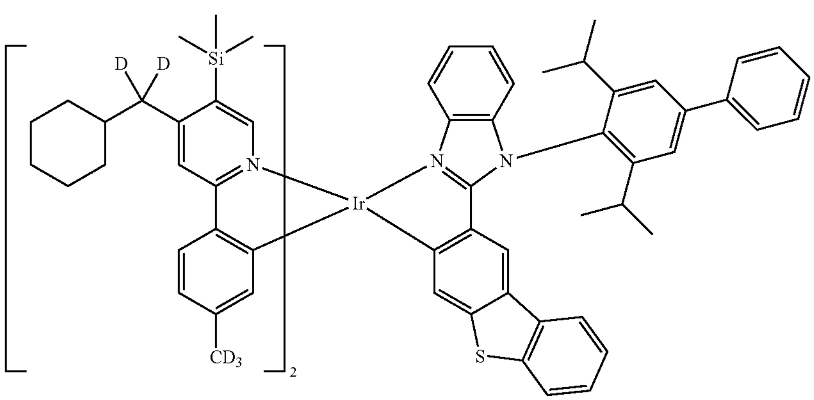

-continued
1077
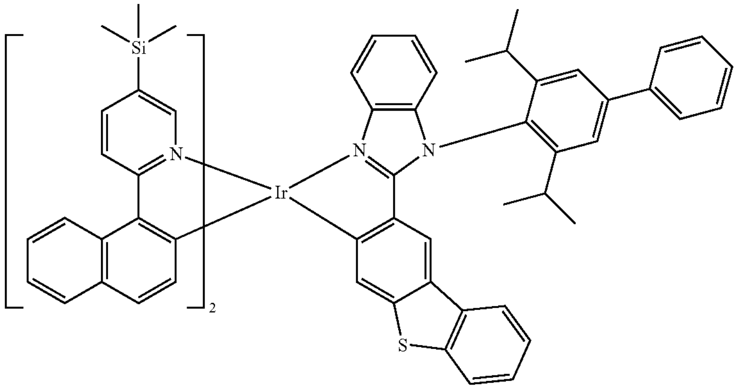
1078
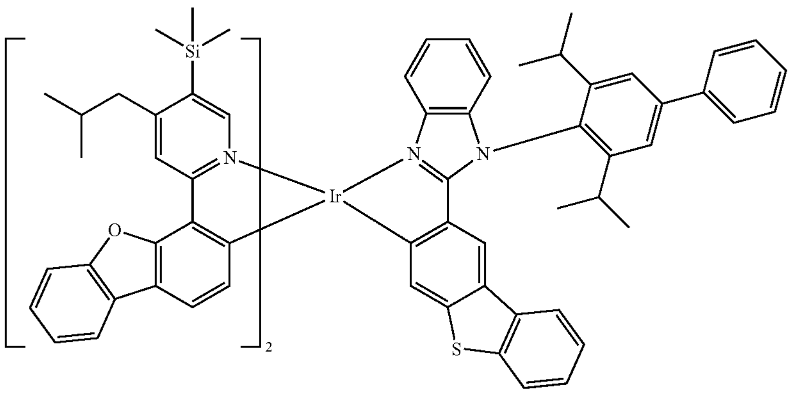
1079
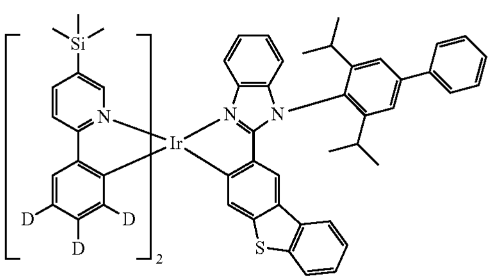
1080
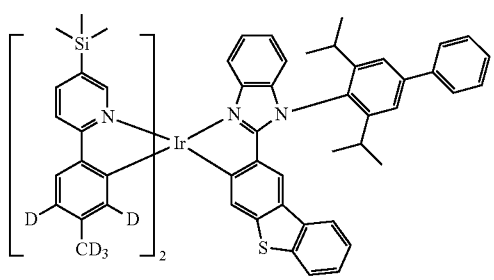
1081
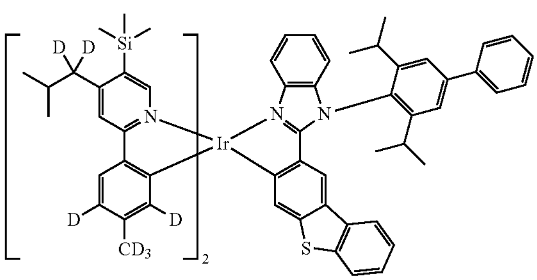
1082
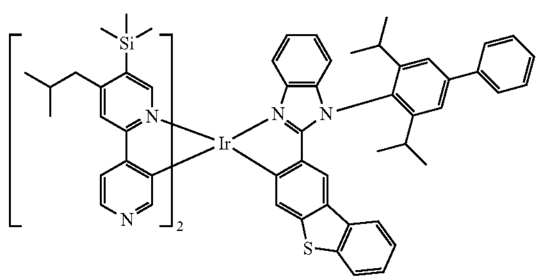

-continued
1083
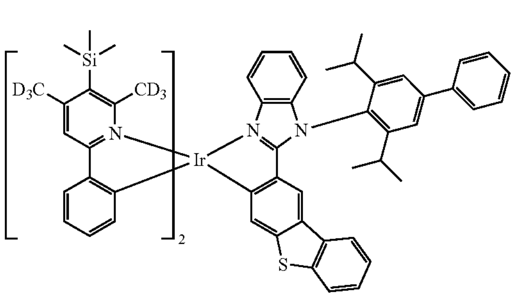
1084
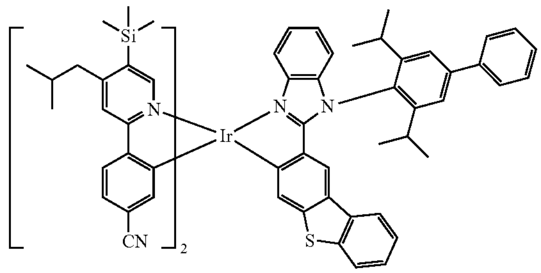
1085
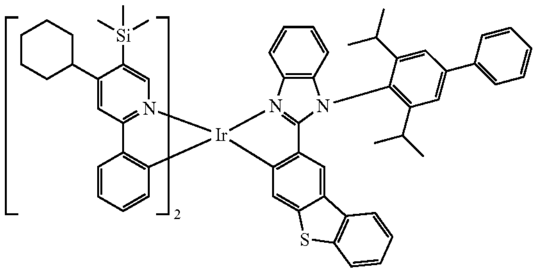
1086
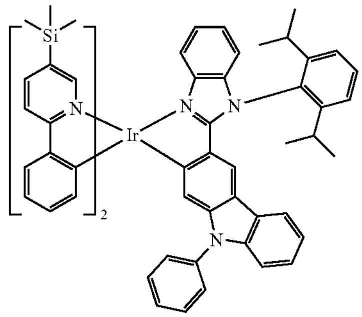
1087
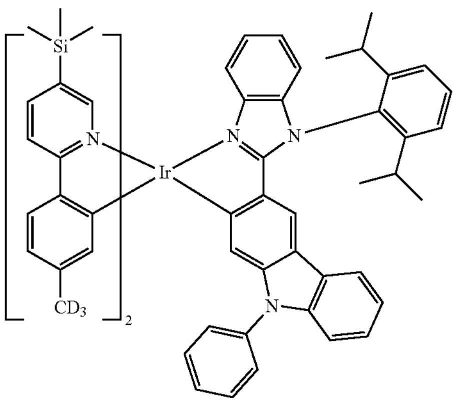
1088
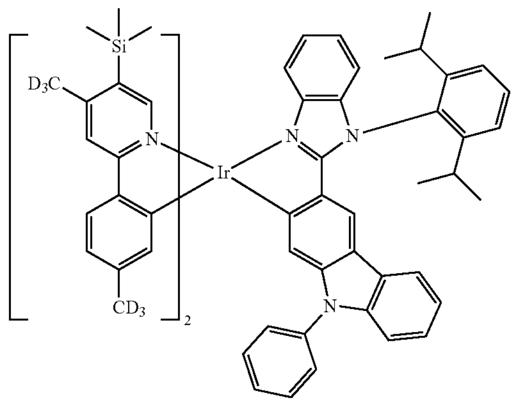
1089
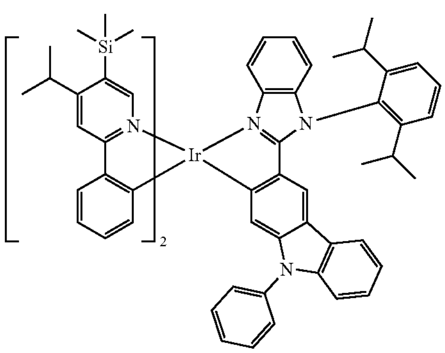
1090
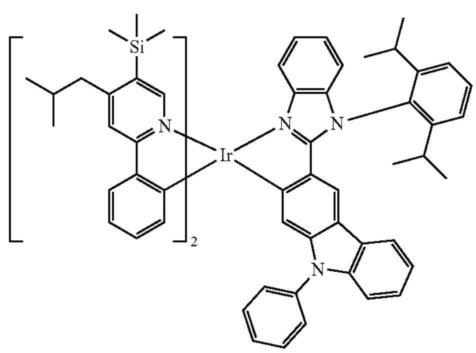

-continued
1091
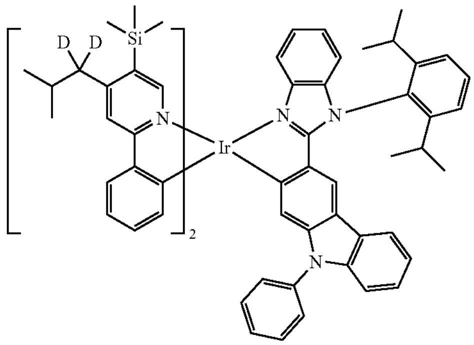
1092
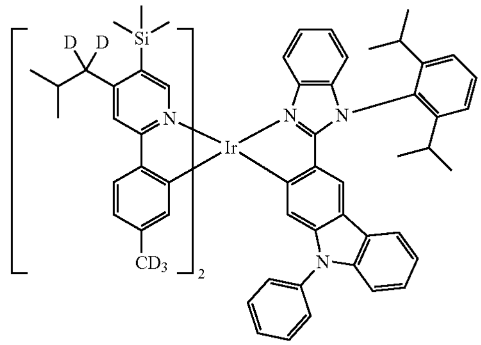
1093
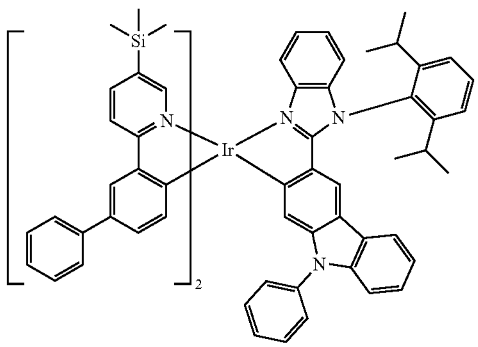
1094
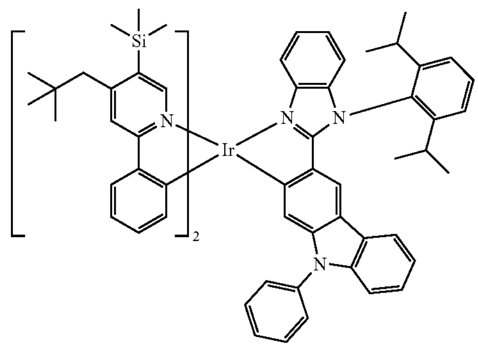
1095
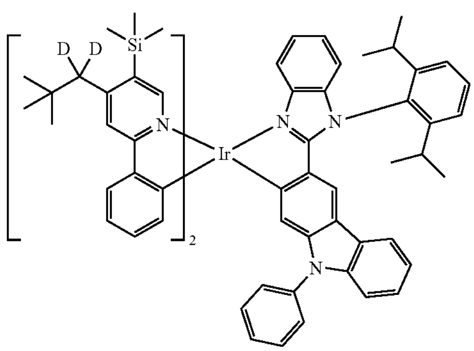
1096
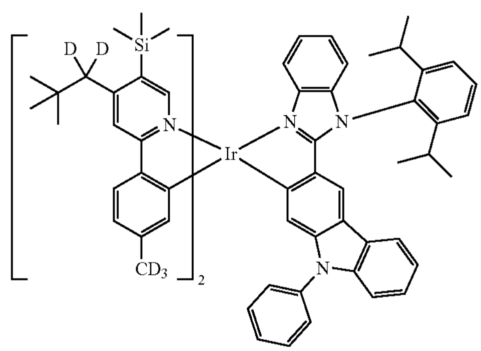
1097
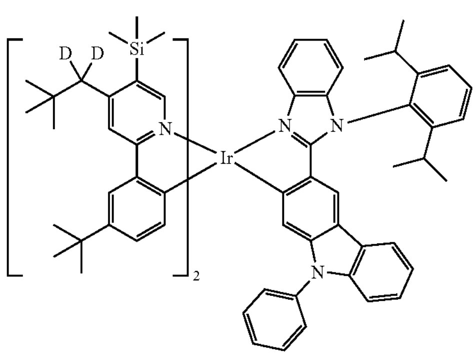
1098
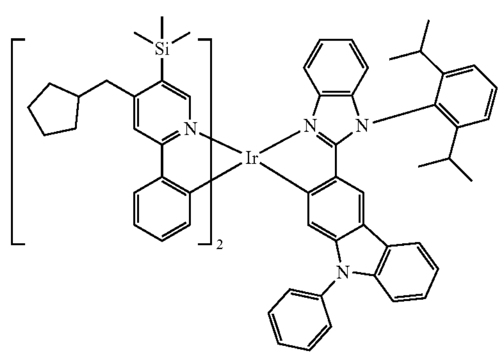

-continued
1099
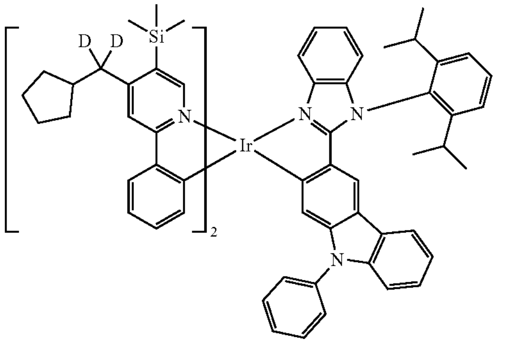
1100
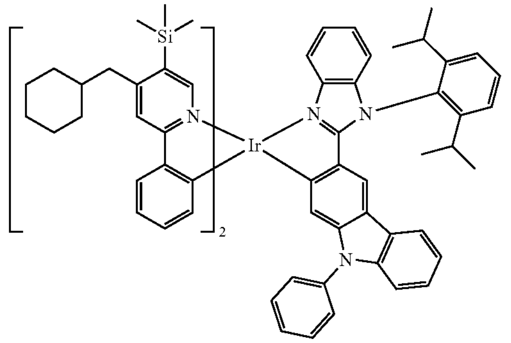
1101
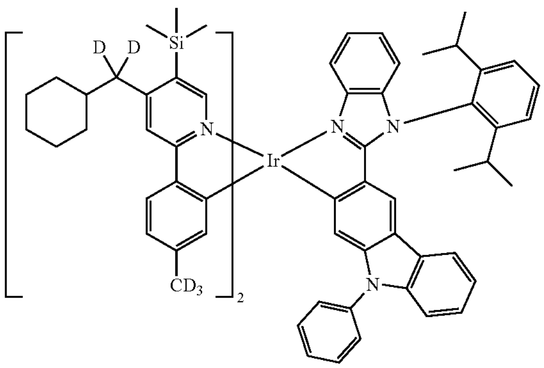
1102
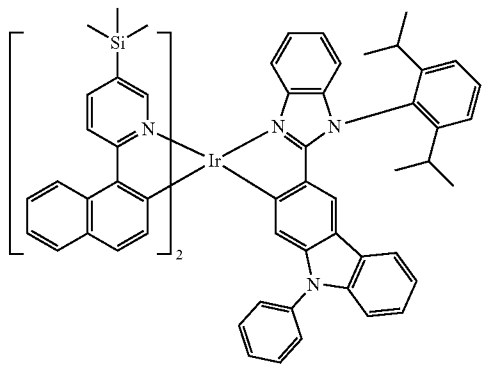
1103
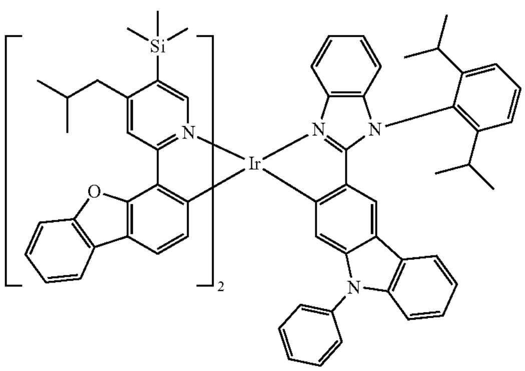
1104
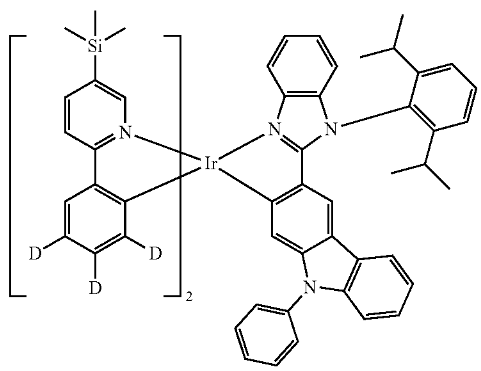
1105
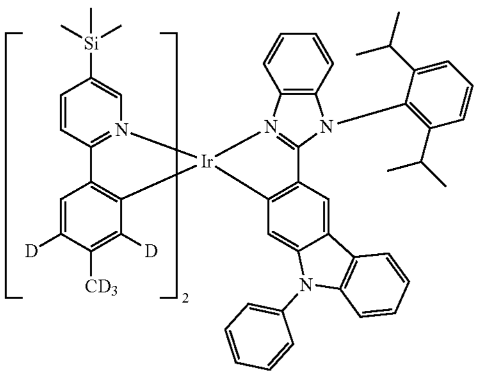
1106
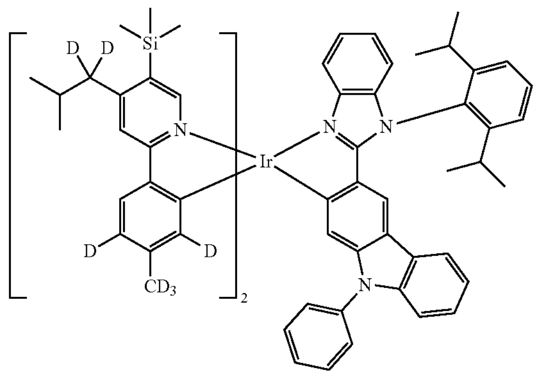

-continued
1107
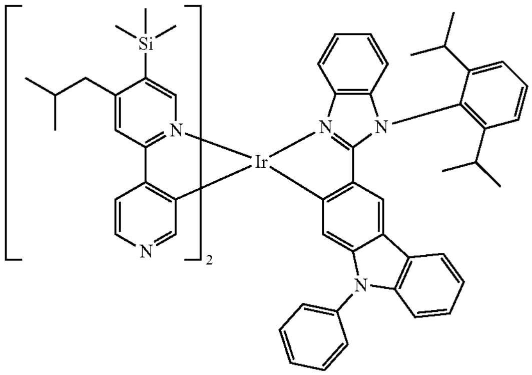
1108
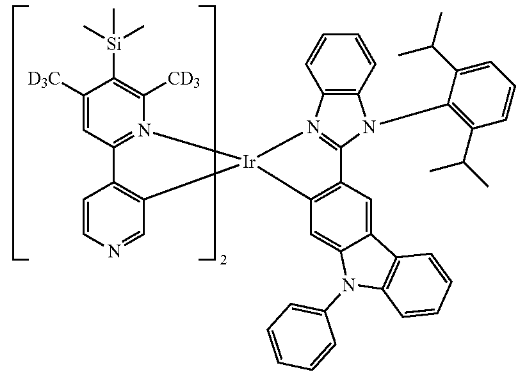
1109
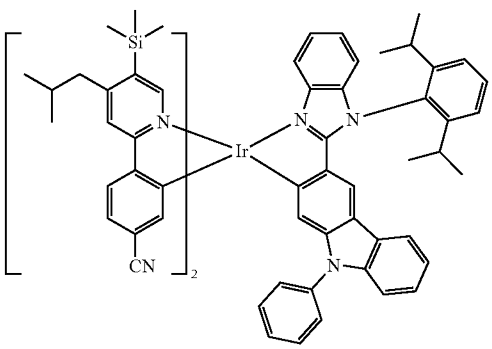
1110
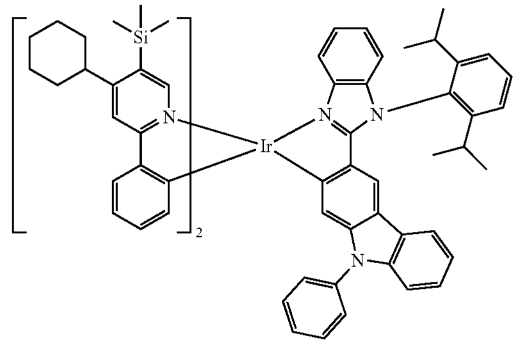
-continued
1111
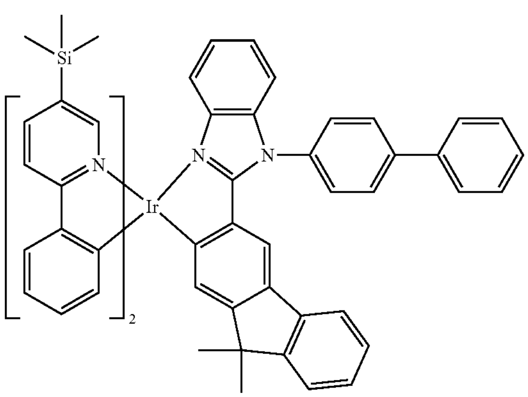
1113
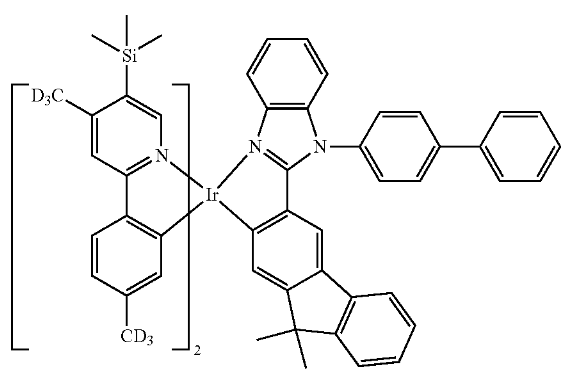
1112
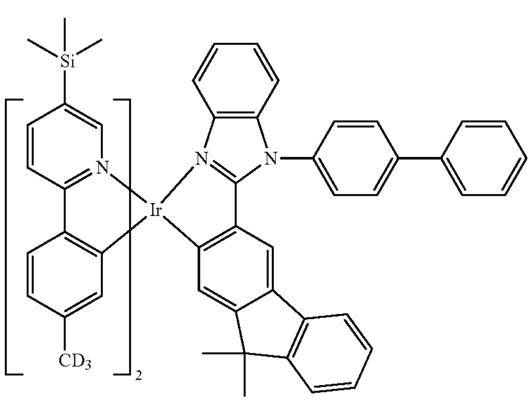
1114
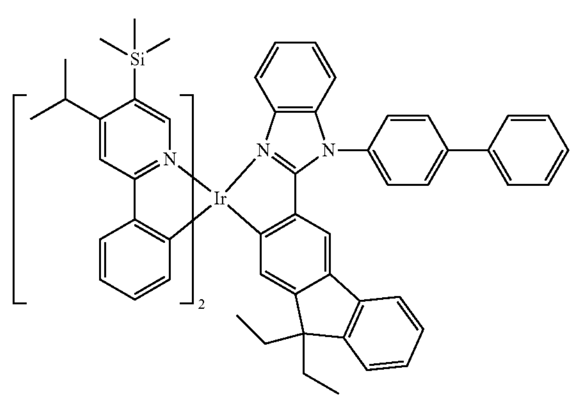

-continued
1115
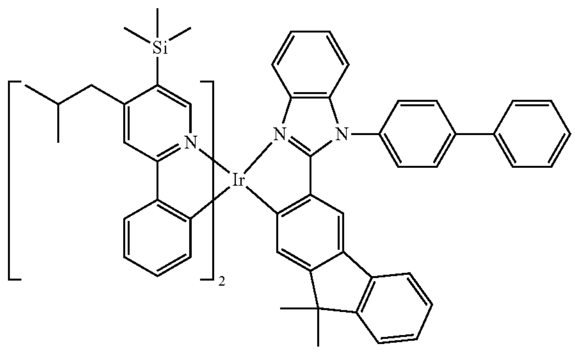
1116
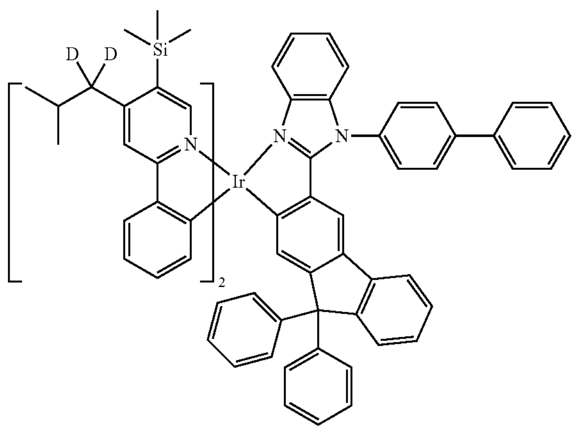
1117
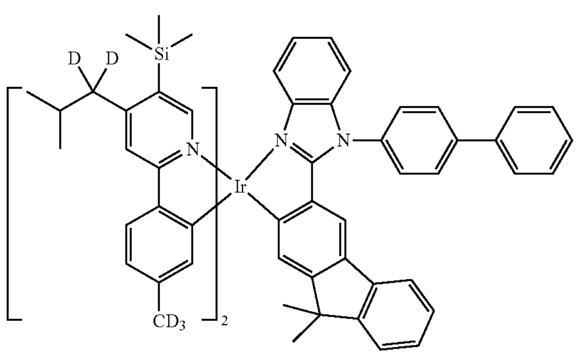
1118
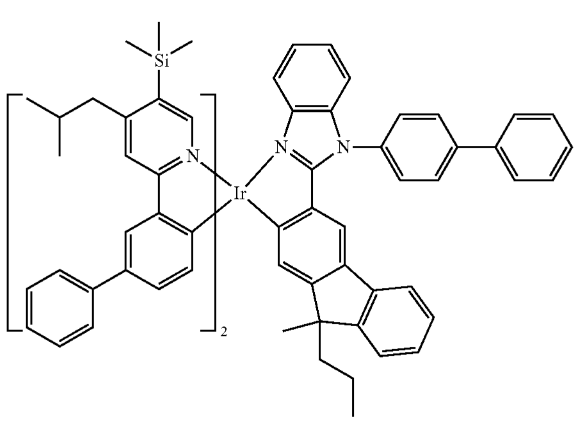
-continued
1119
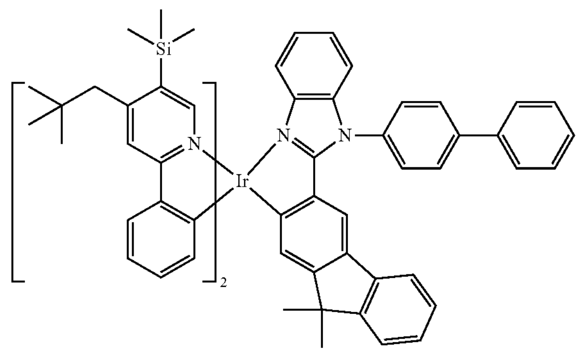
1120
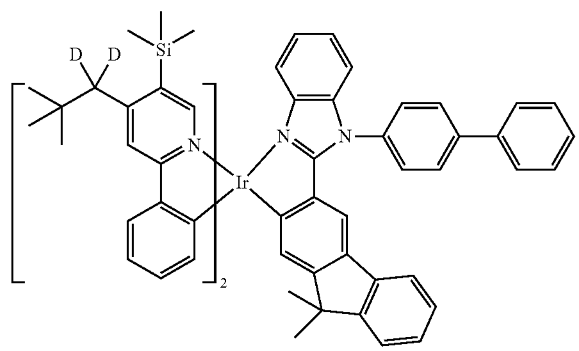
1121
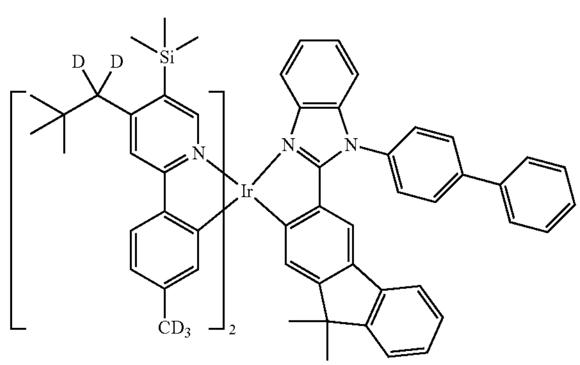
1122
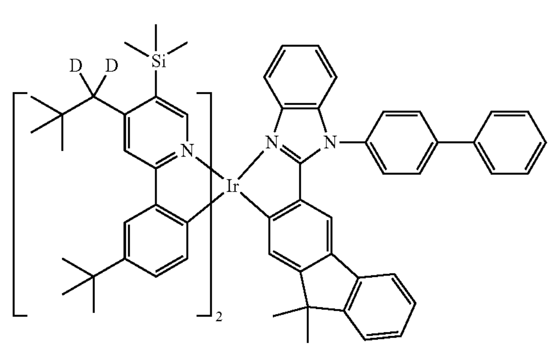

1123
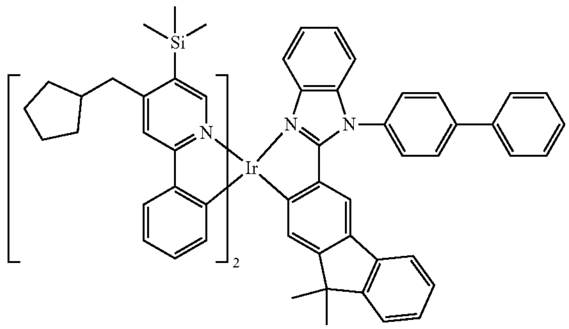
1124
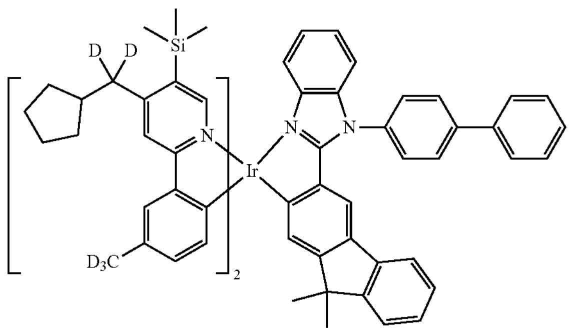
1125
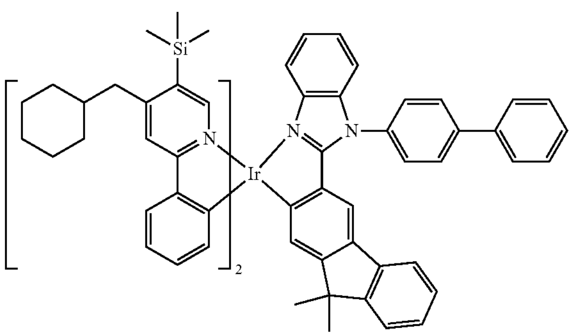
1126
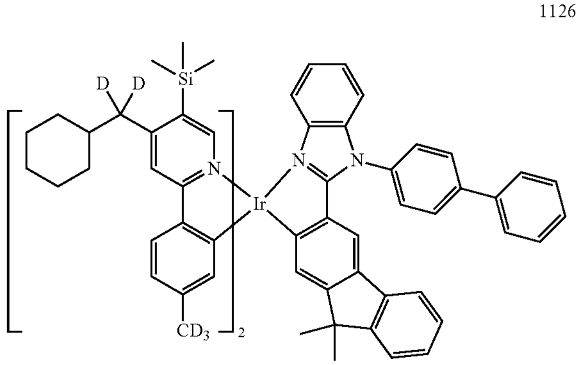
1127
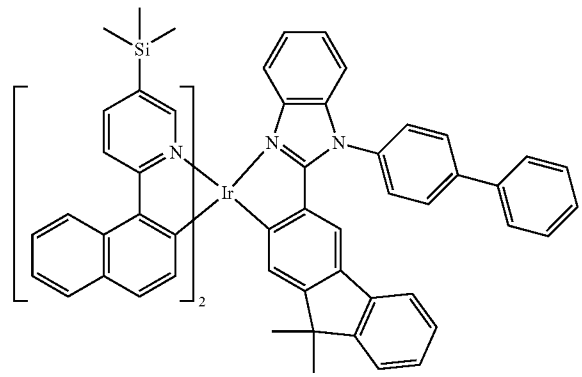
1128
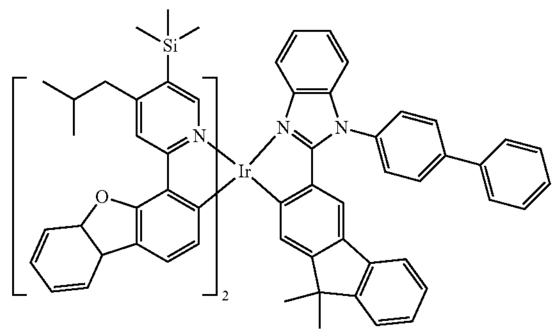
1129
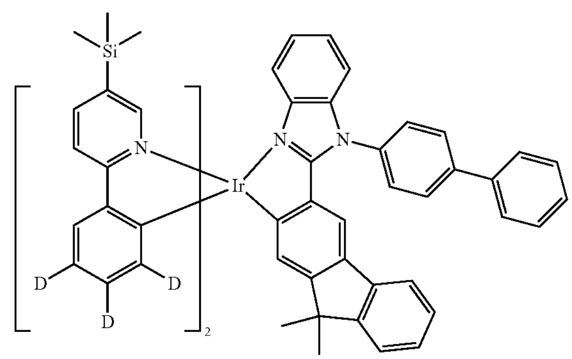
1130
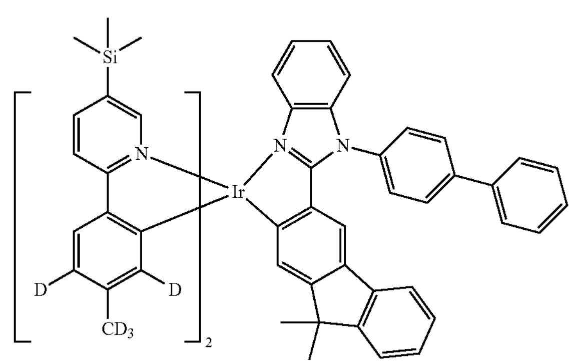

-continued
1131
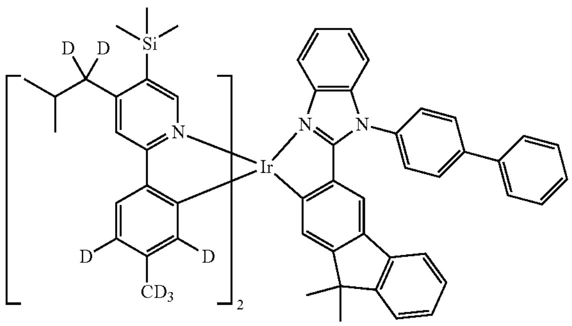
1132
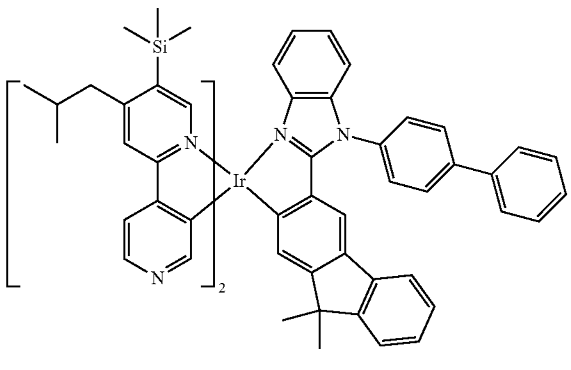
1133
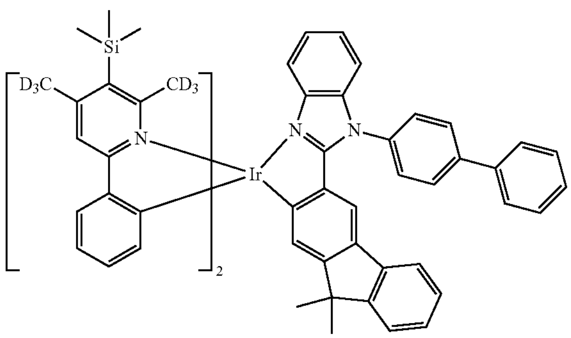
1134
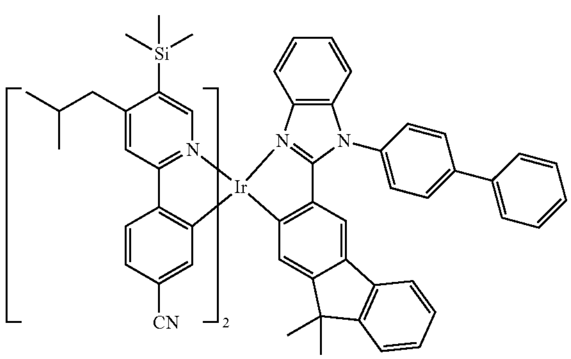
-continued
1135
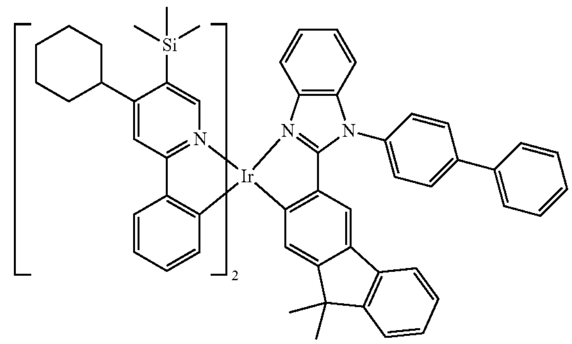
1136
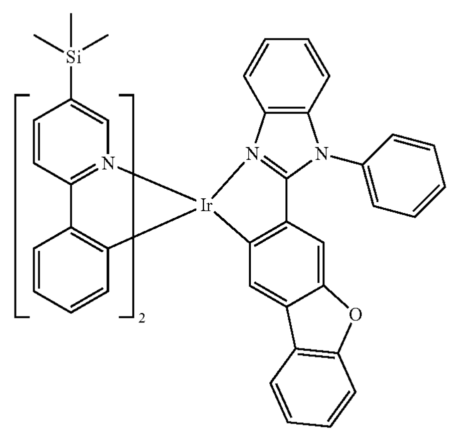
1137
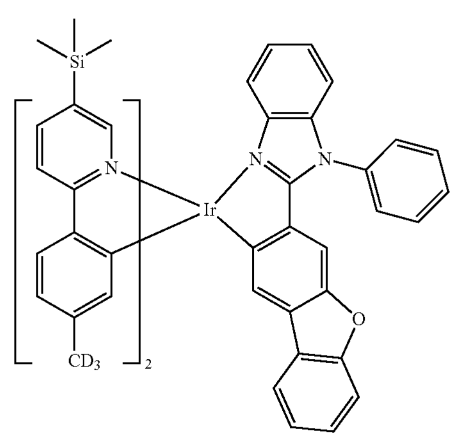

-continued
1138
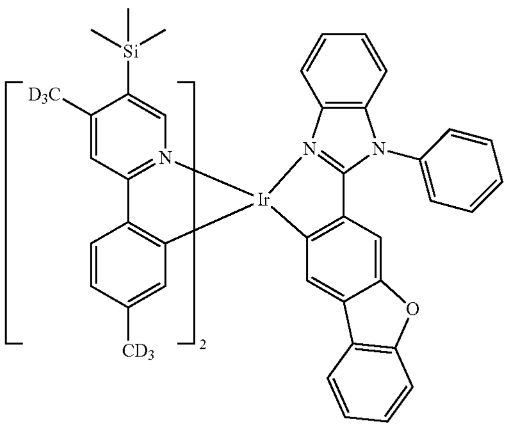
1139
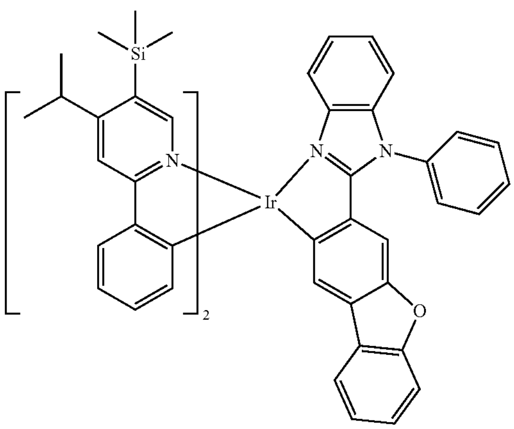
1140
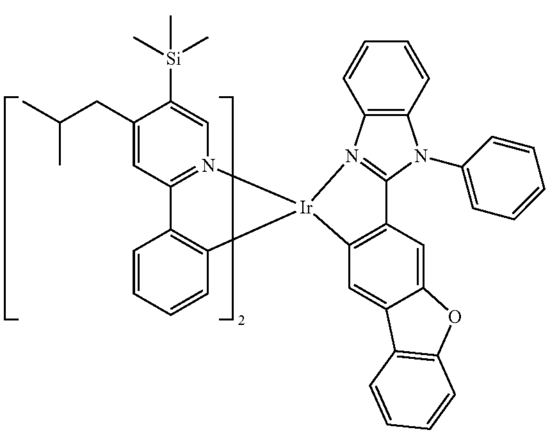
-continued
1141
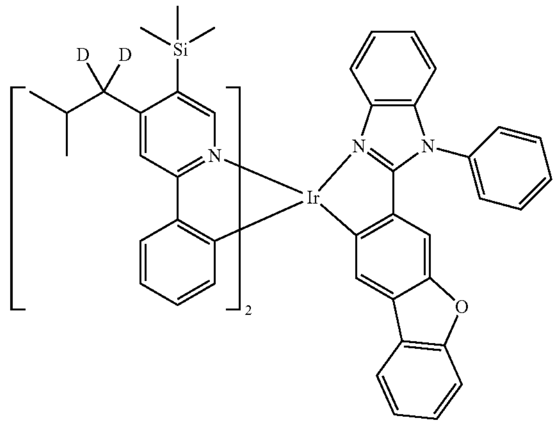
1142
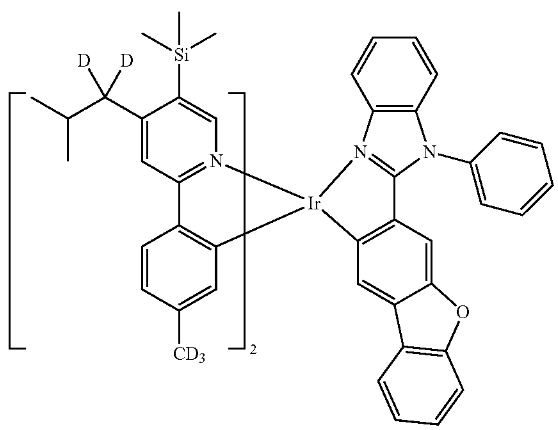
1143
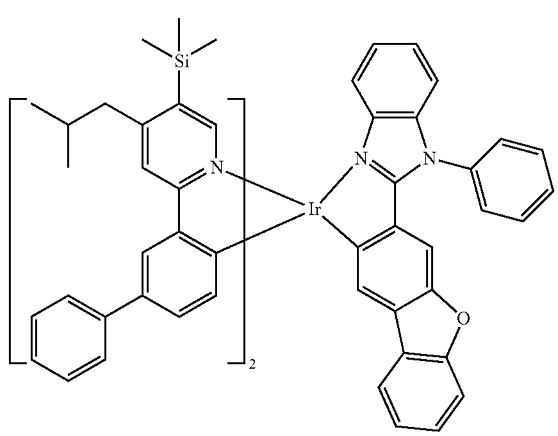

-continued
1144
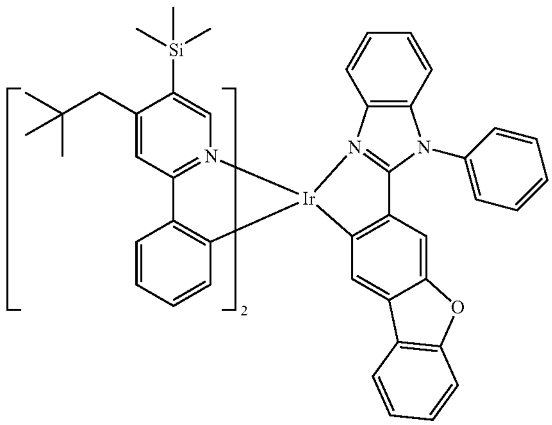
1145
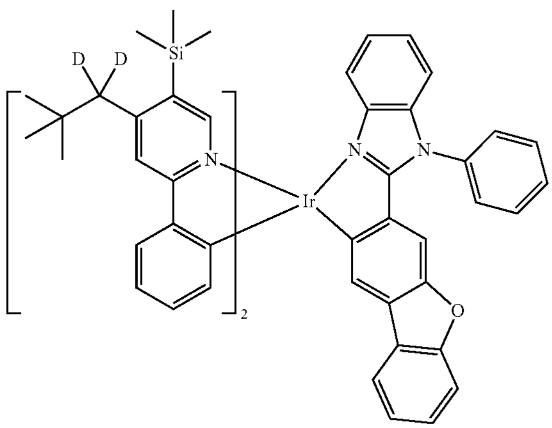
1146
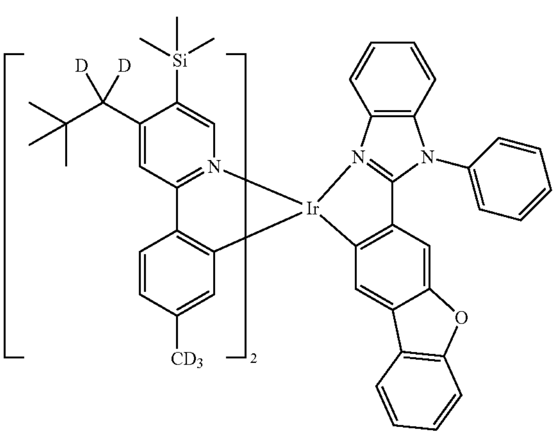
-continued
1147
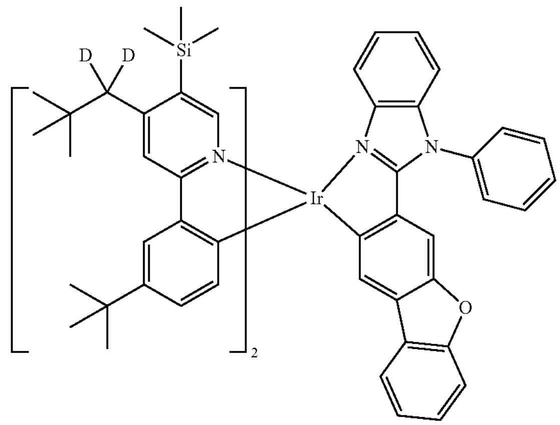
1148
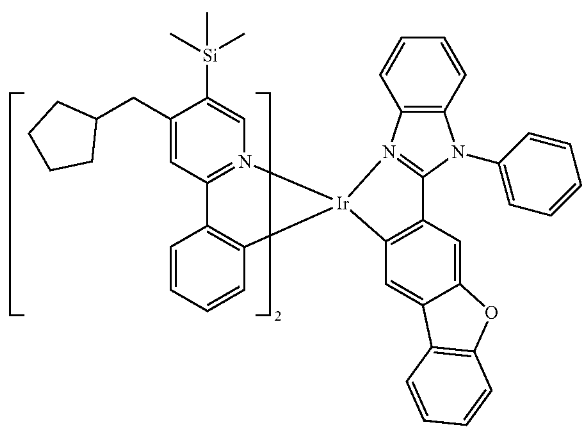
1149
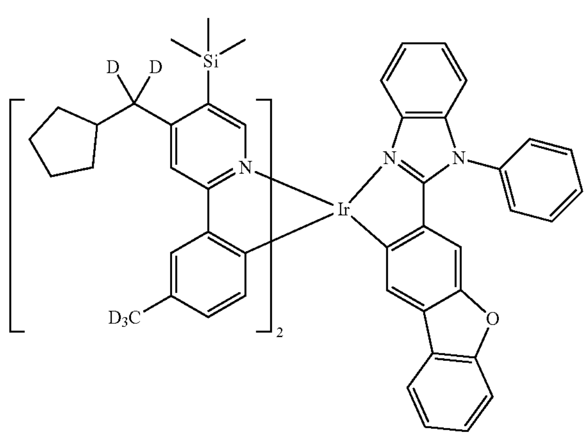

-continued
1150
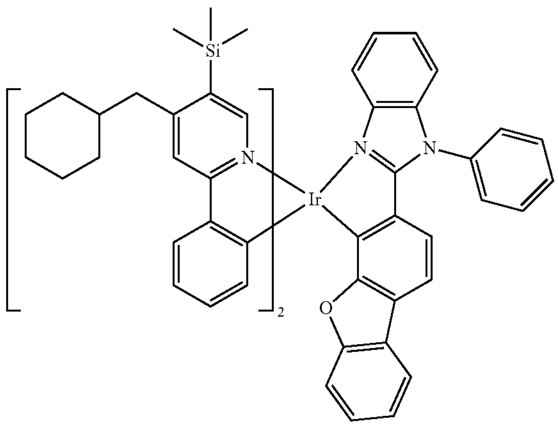
1151
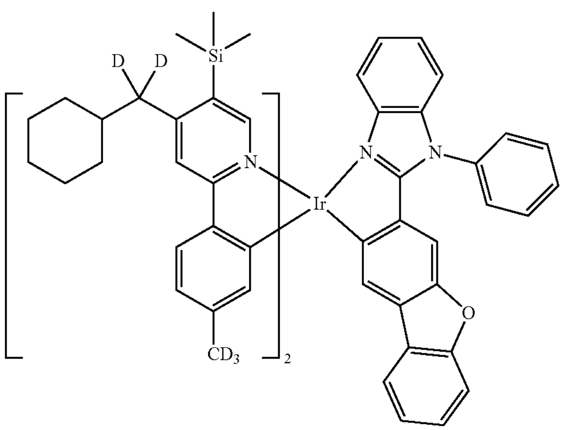
1152
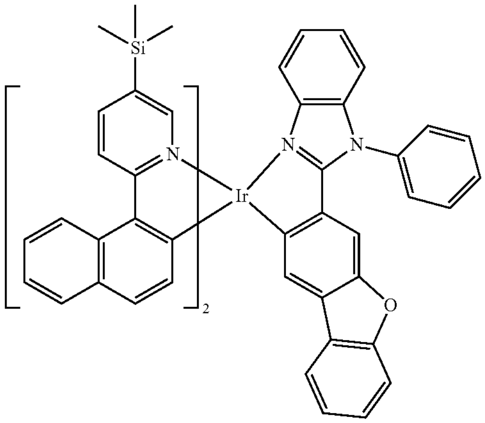
-continued
1153
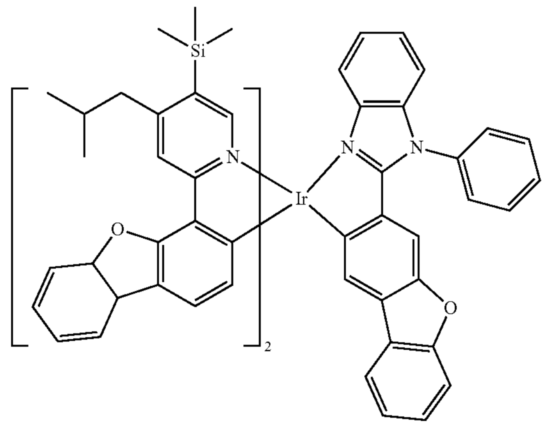
1154
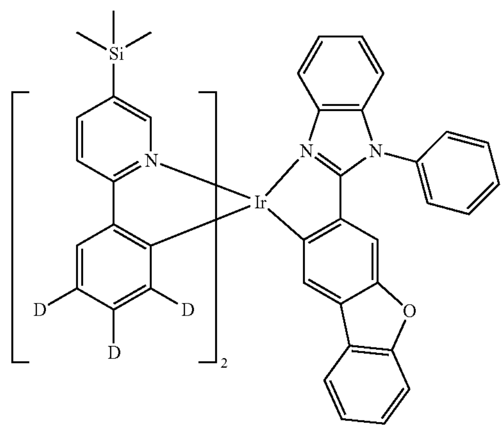
1155
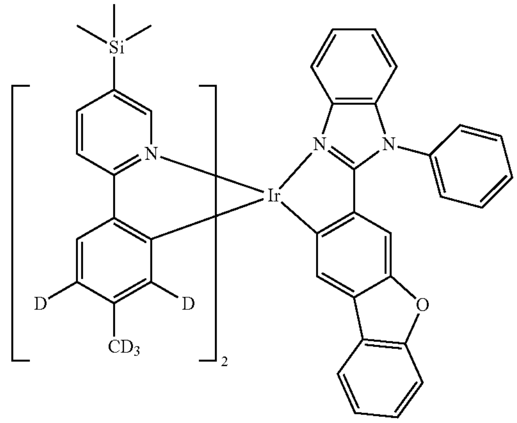

-continued
1156
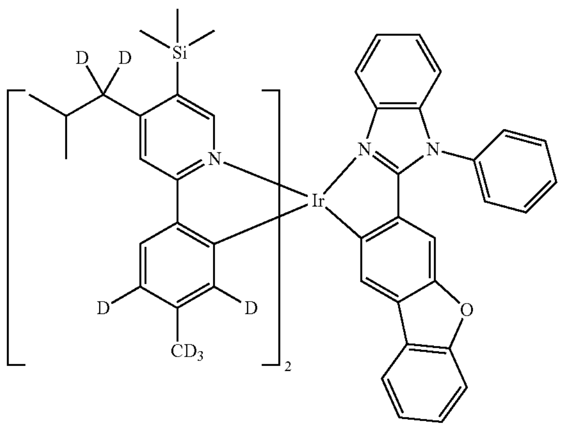
1157
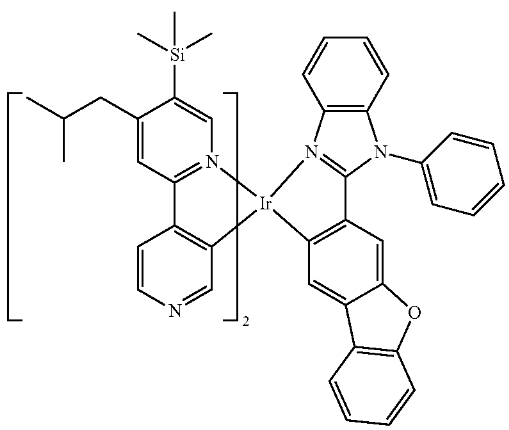
1158
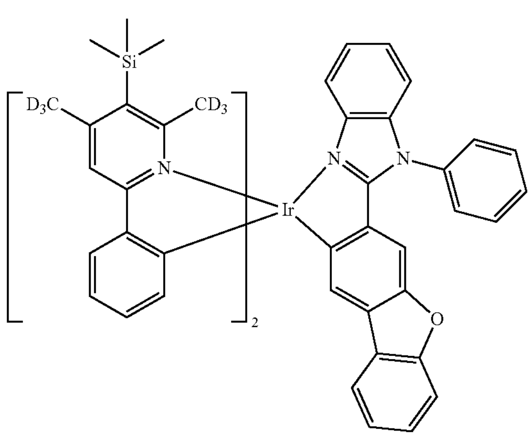
-continued
1159
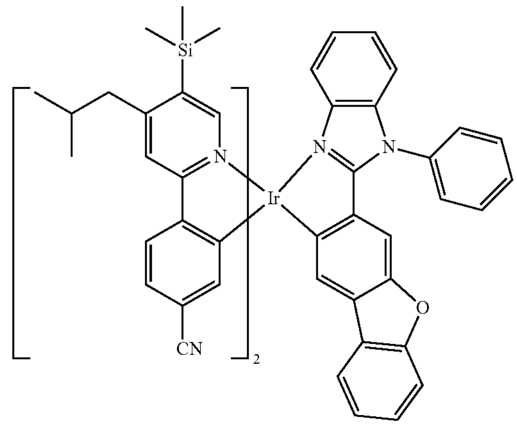
1160
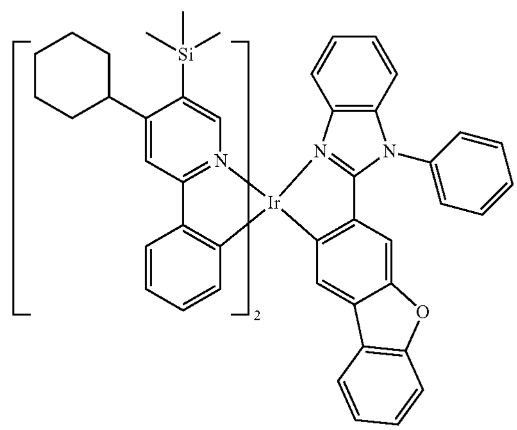
1161
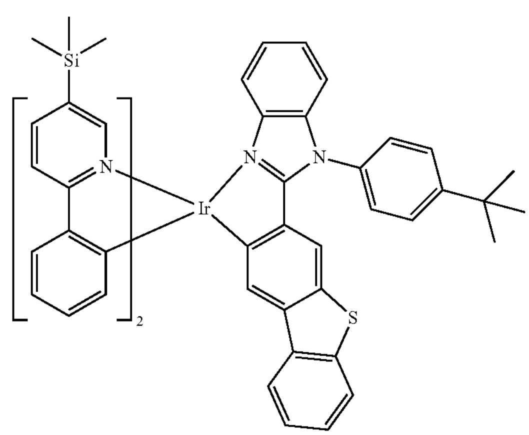

-continued
1162
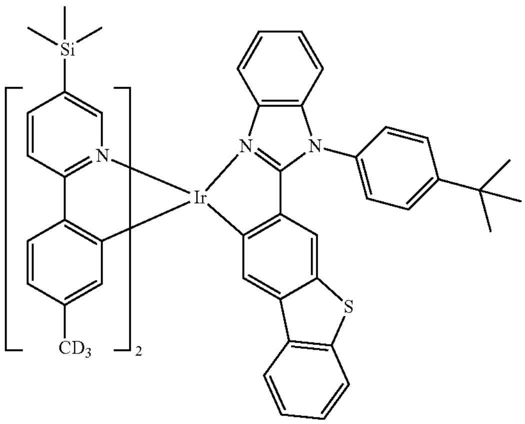
1163
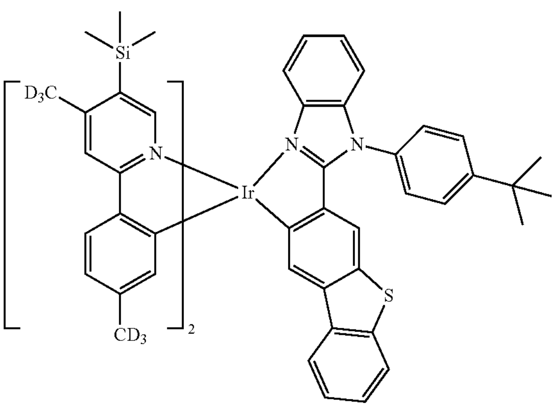
1164
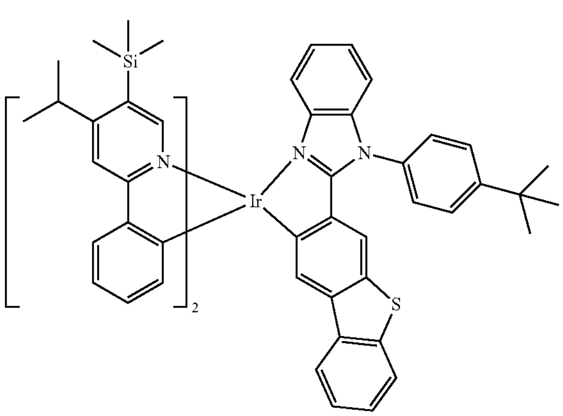
-continued
1165
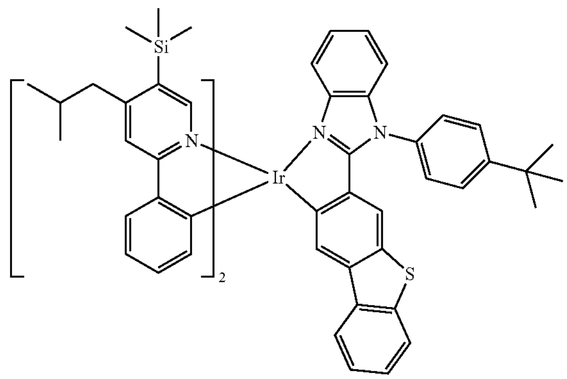
1166
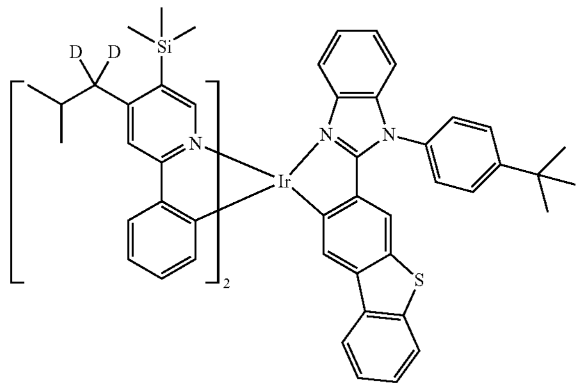
1167
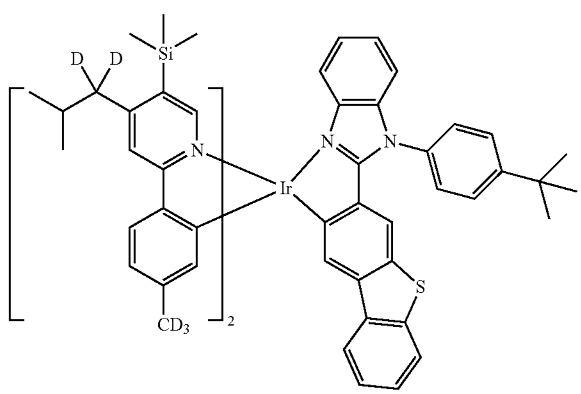
1168
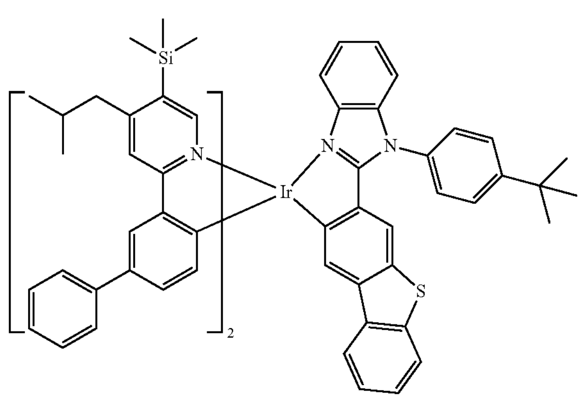

-continued
1169
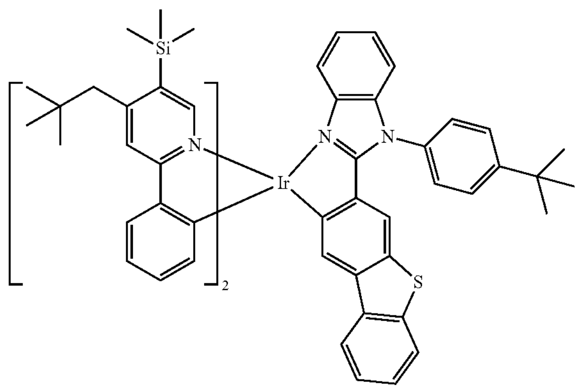
1170
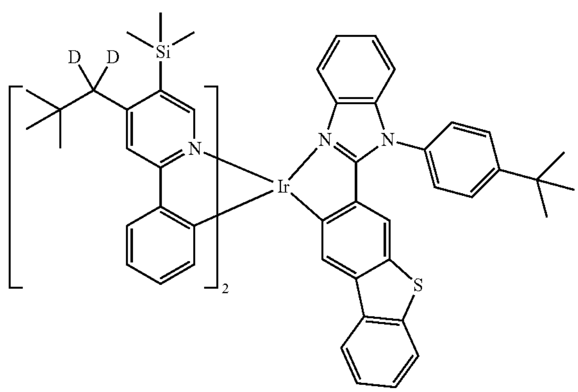
1171
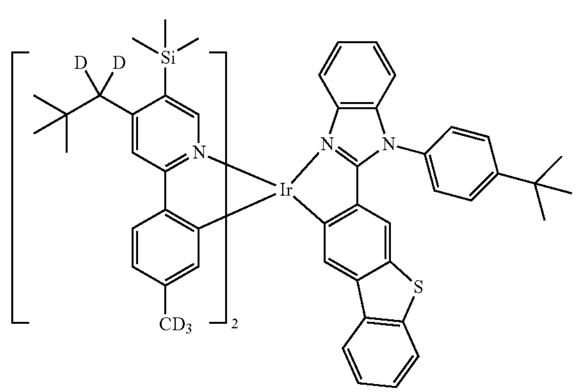
1172
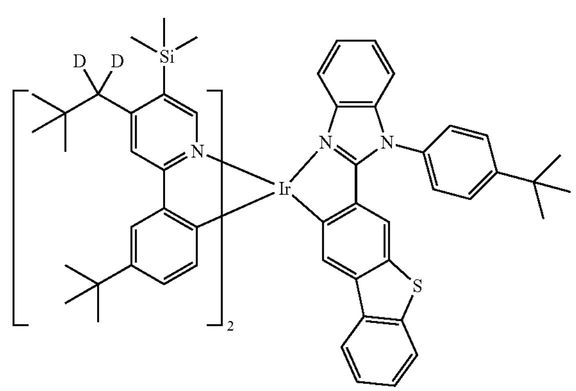
-continued
1173
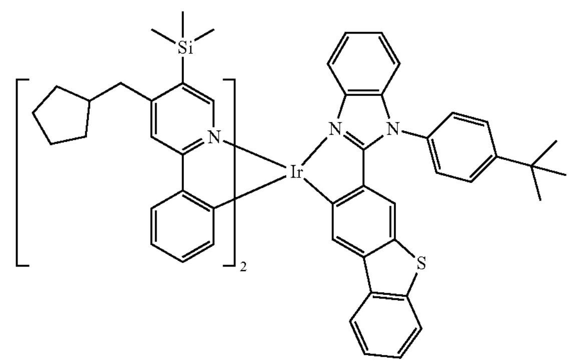
1174
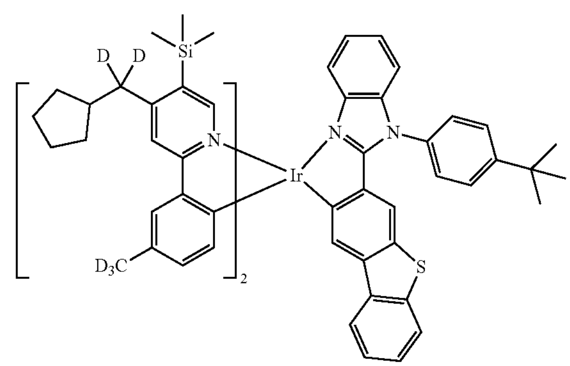
1175
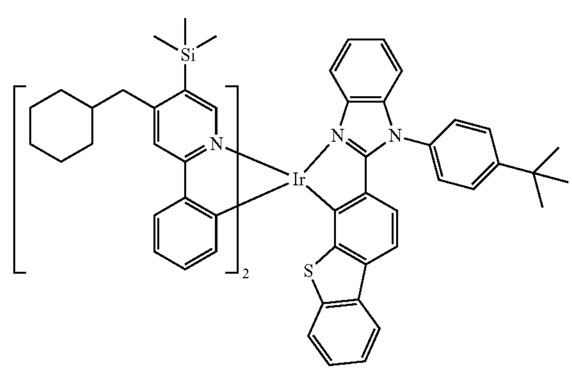
1176
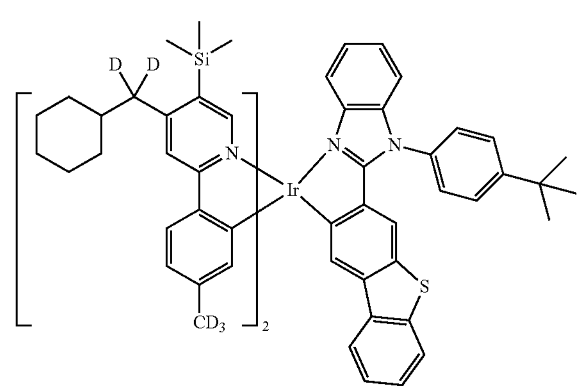

-continued
1177
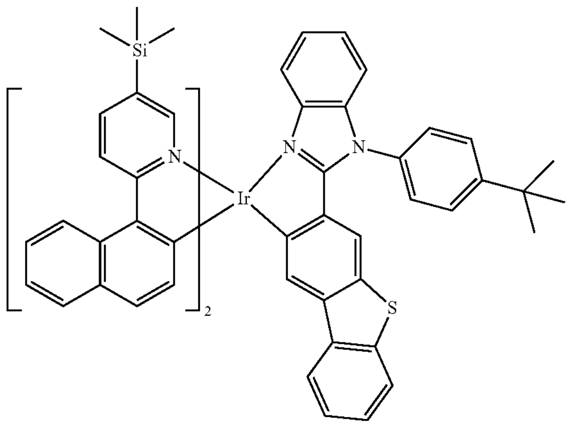
1178
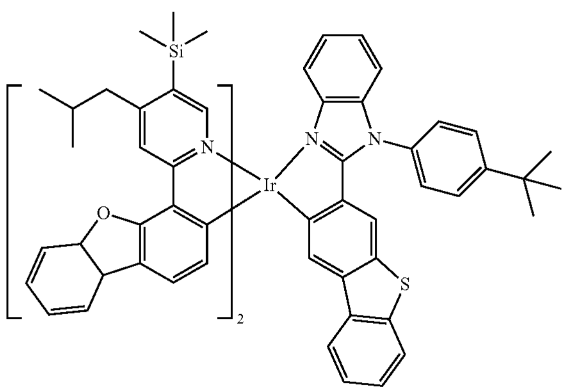
1179
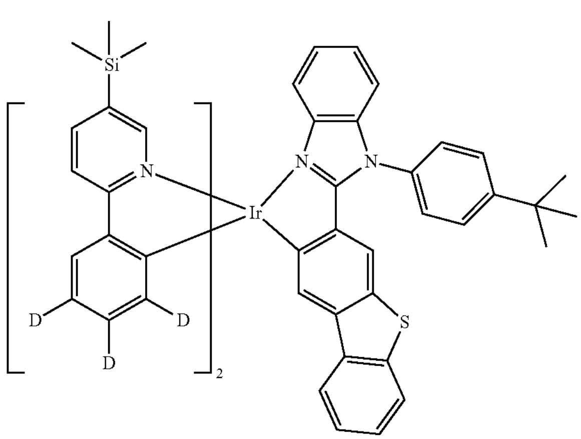
-continued
1180
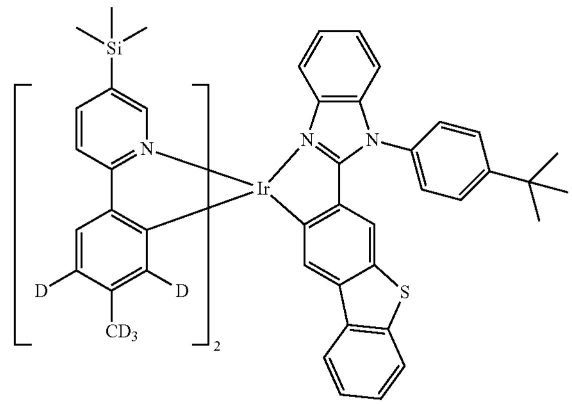
1181
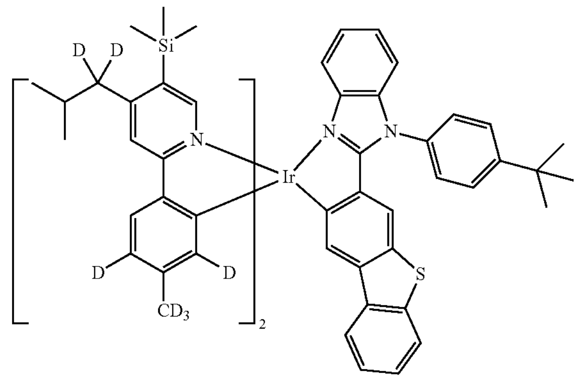
1182
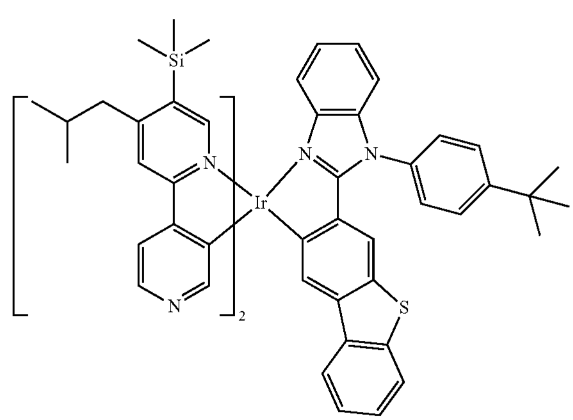

-continued
1183
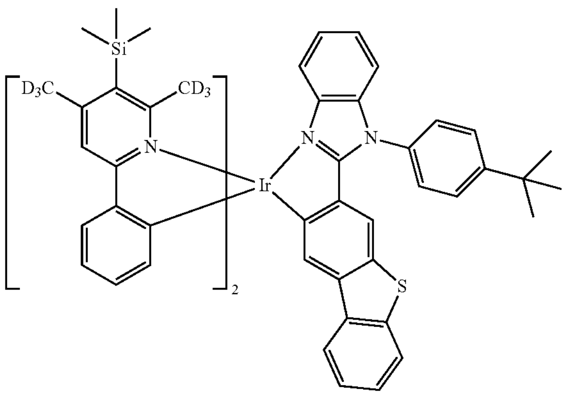
1184
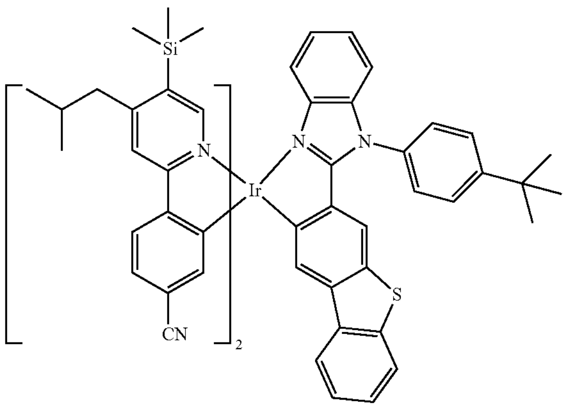
1185
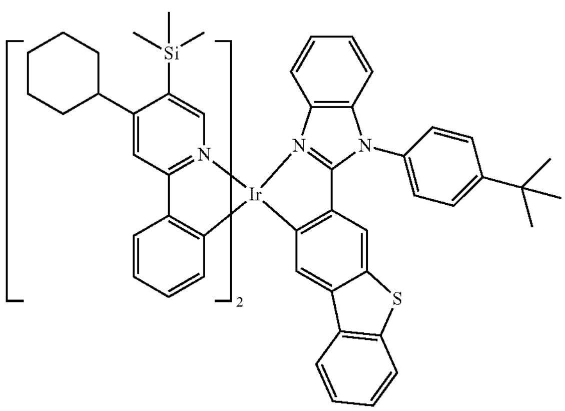
1186
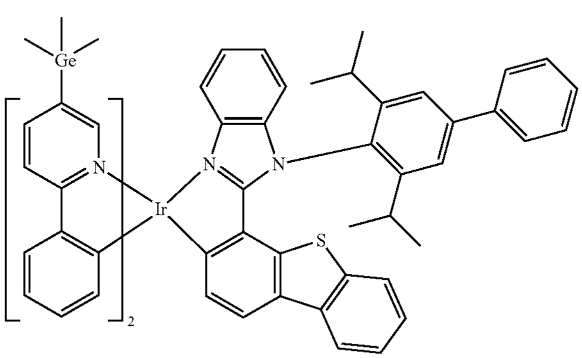
-continued
1187
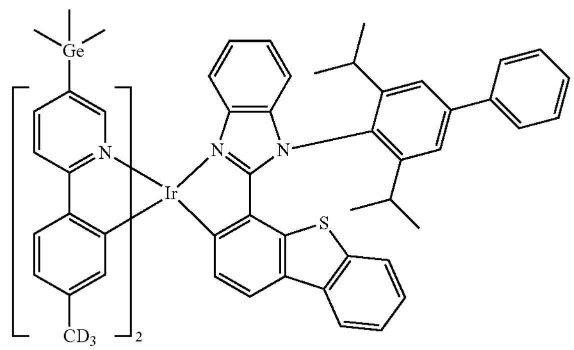
1188
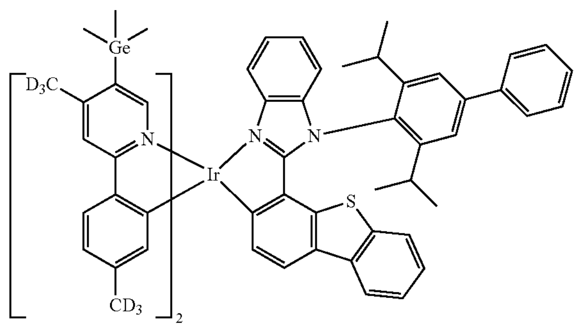
1189
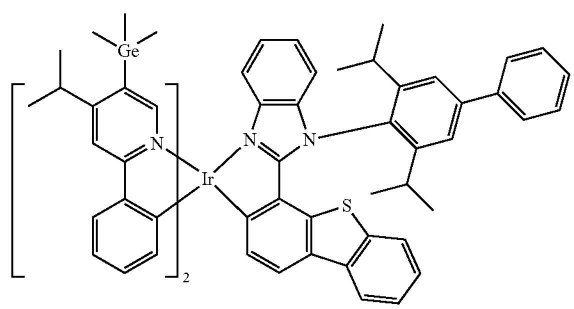
1190
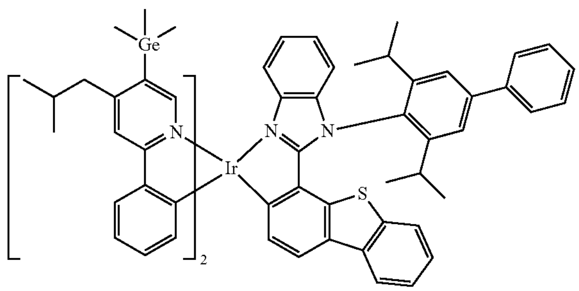

-continued
1191
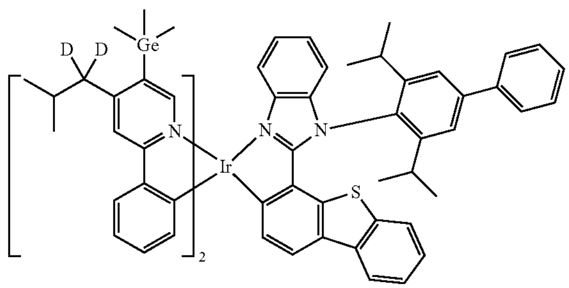
1192
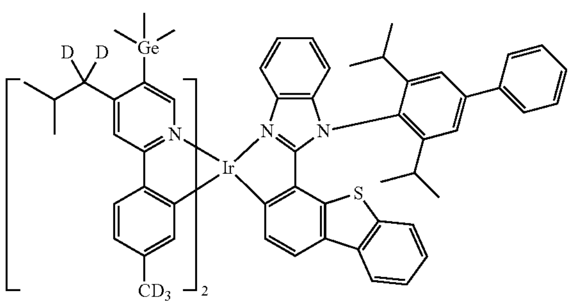
1193
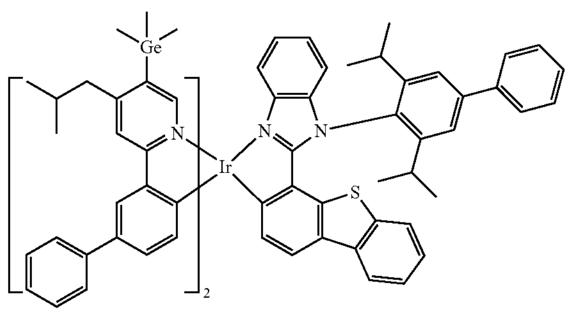
1194
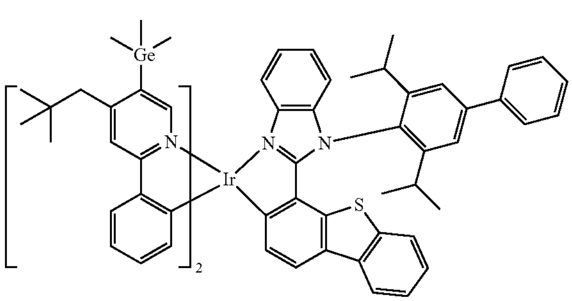
1195
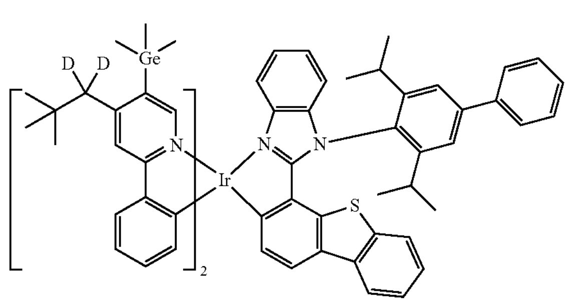
-continued
1196
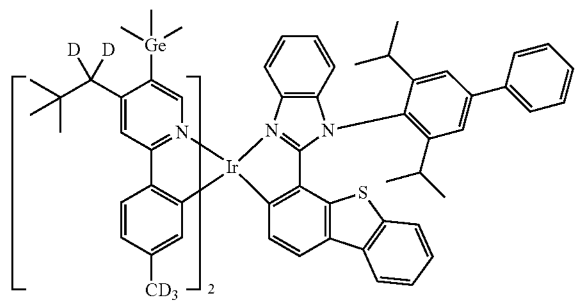
1197
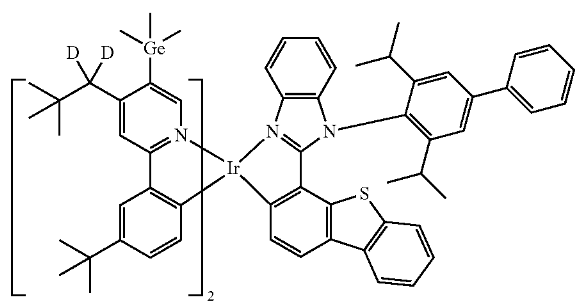
1198
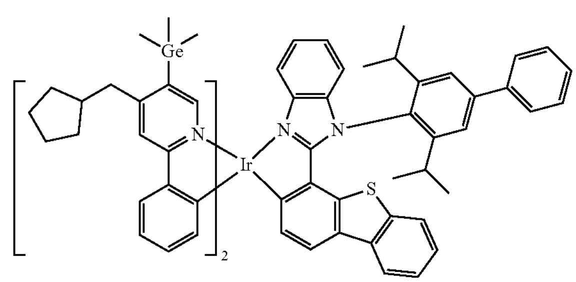
1199
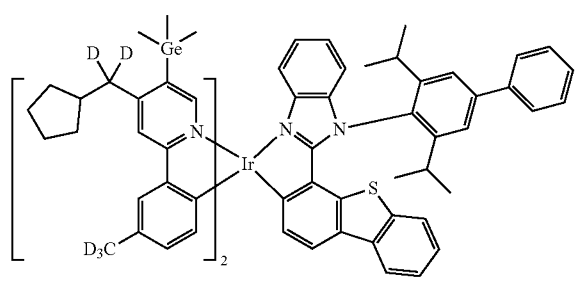
1200
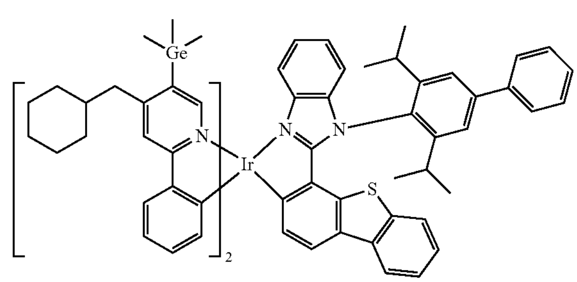

-continued
1201
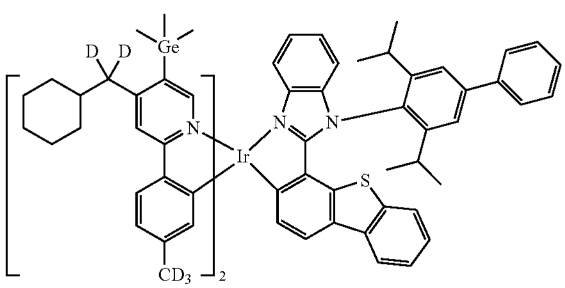
1202
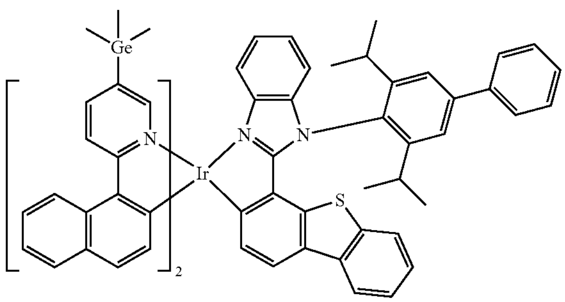
1203
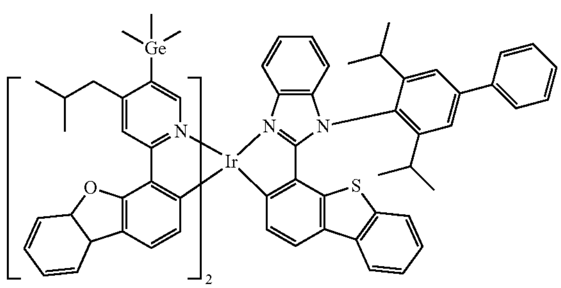
1204
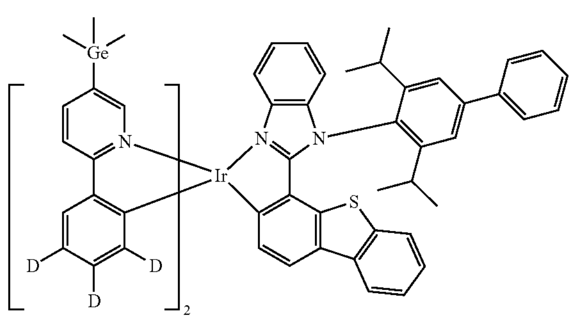
1205
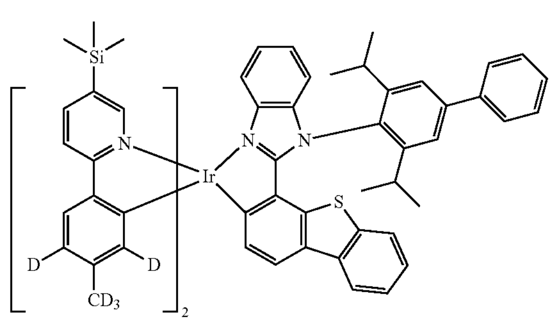
-continued
1206
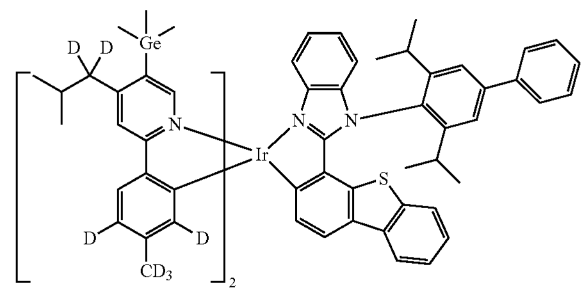
1207
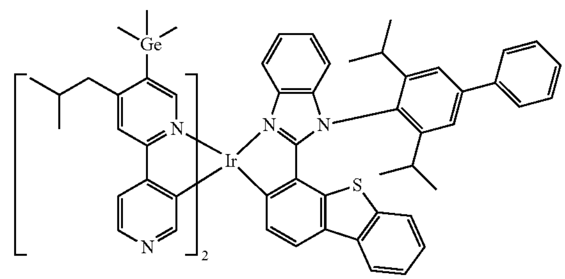
1208
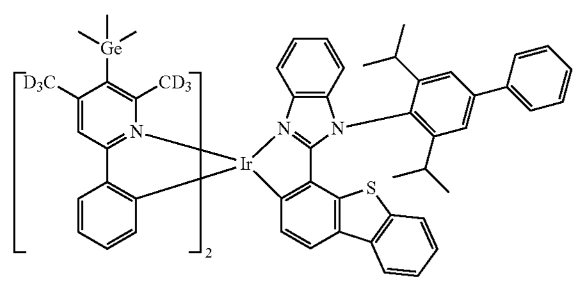
1209
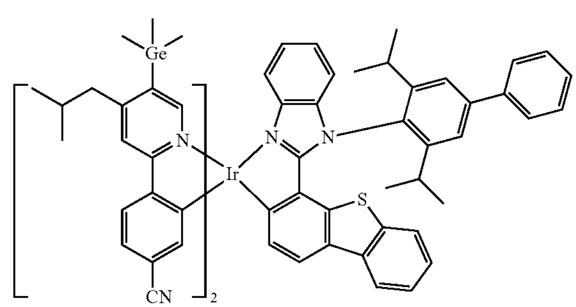
1210
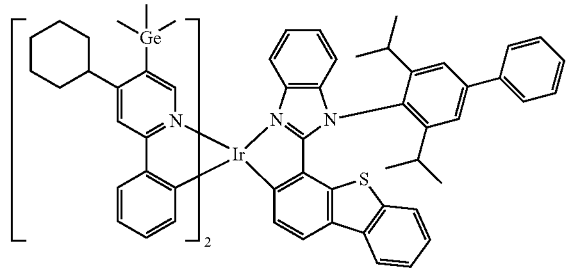

-continued
1211
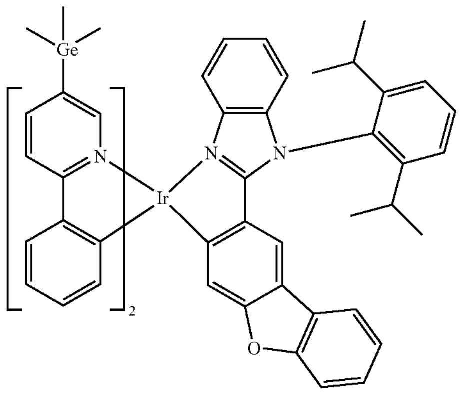
1212
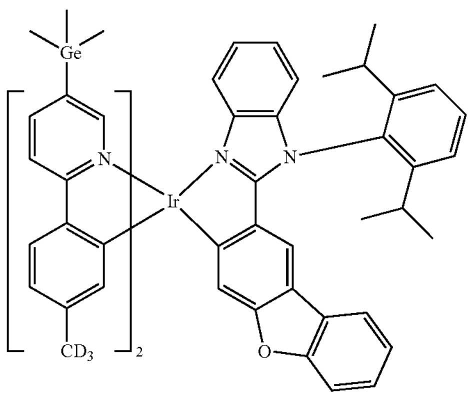
1213
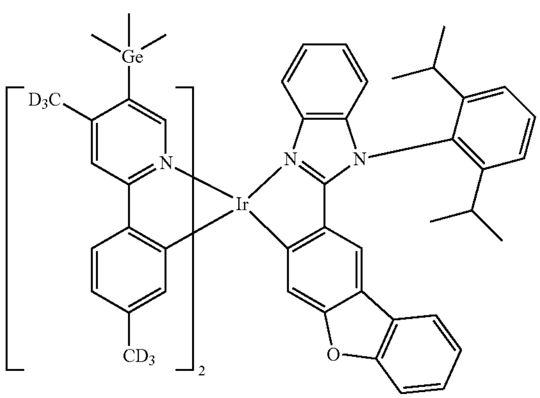
1214
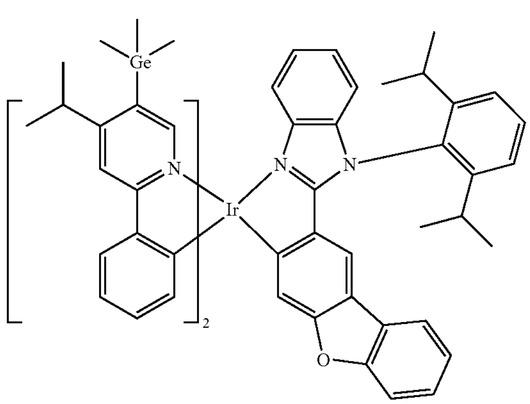
-continued
1215
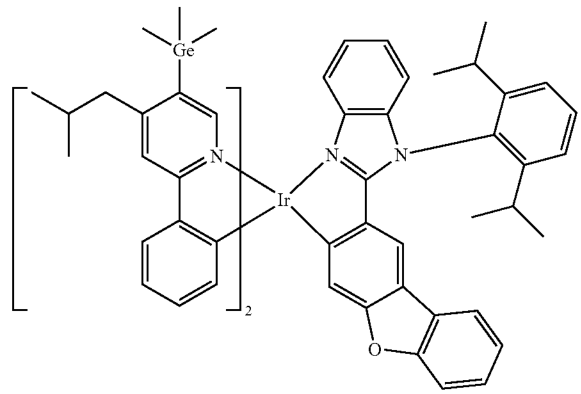
1216
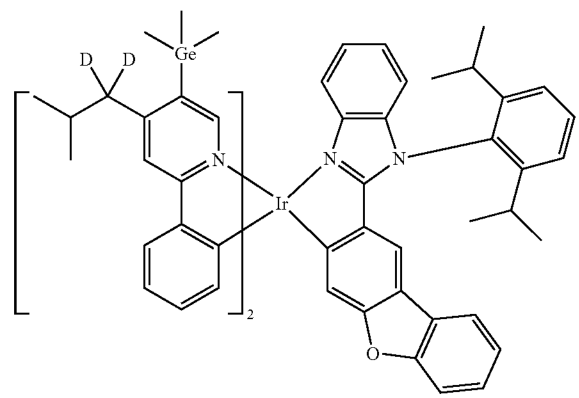
1217
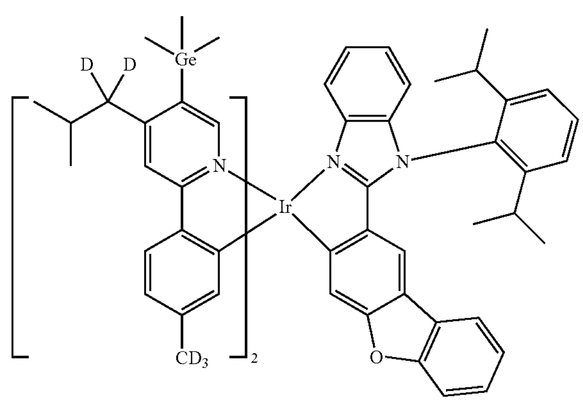
1218
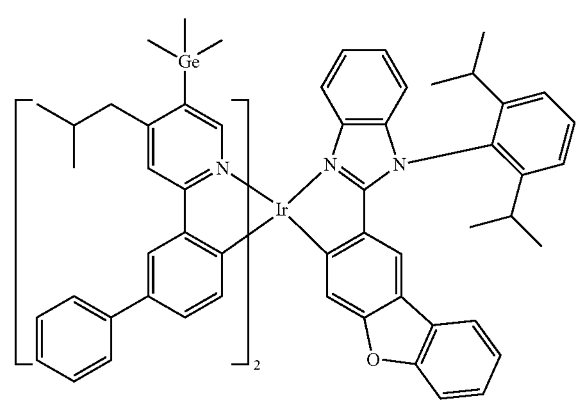

1219
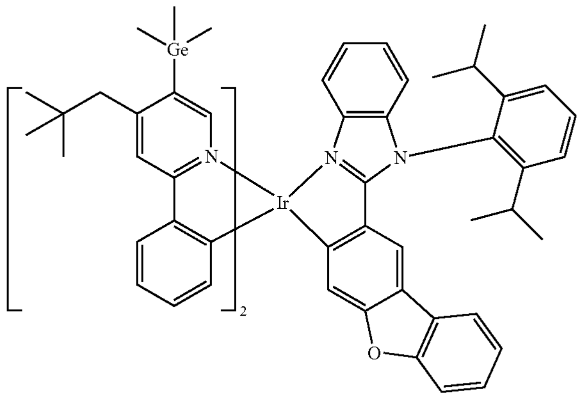
1220
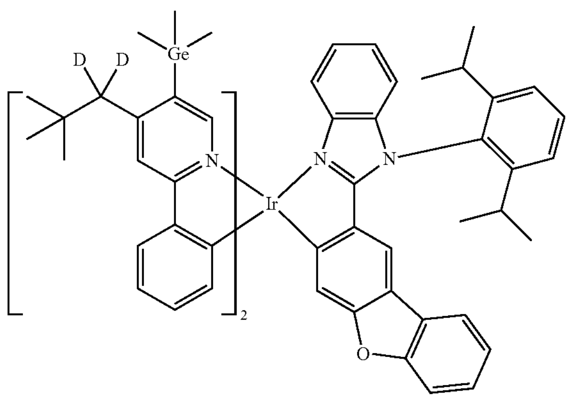
1221
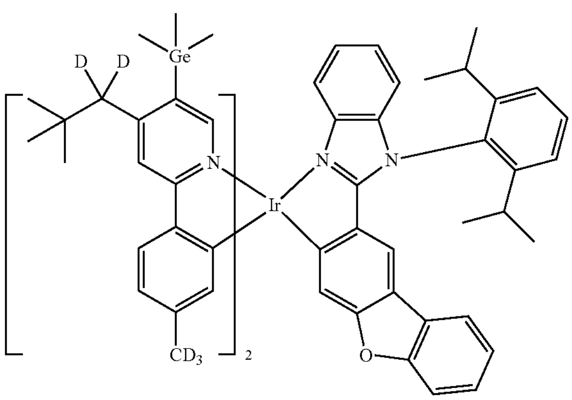
1222
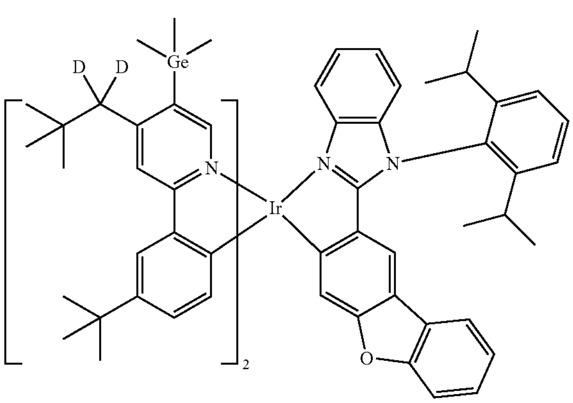
1223
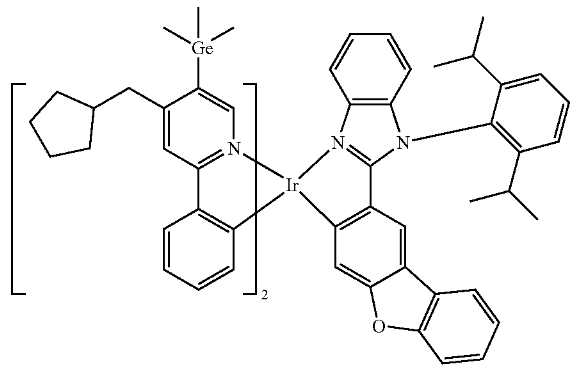
1224
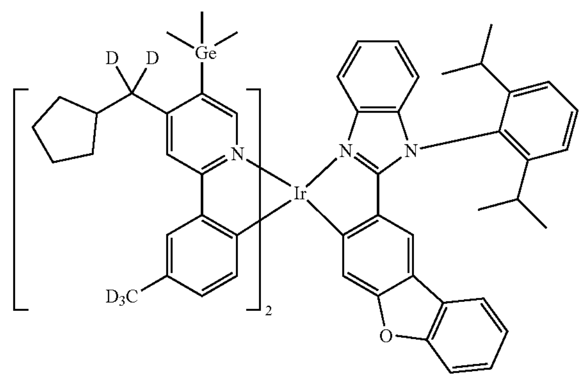
1225
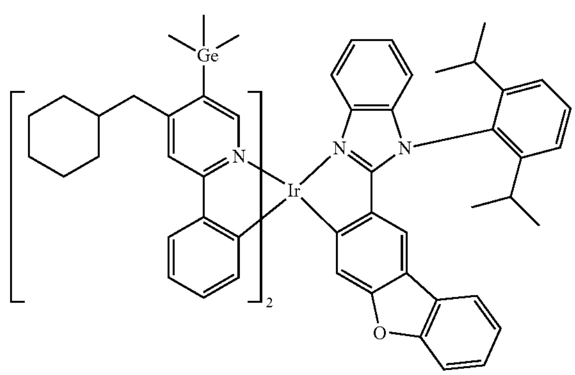
1226
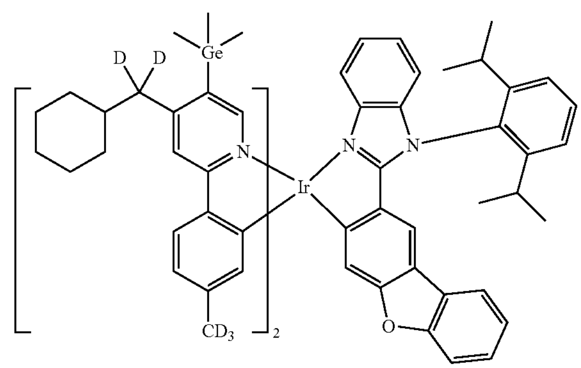

1227
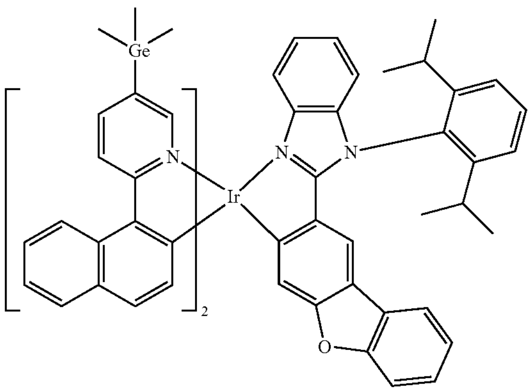
1228
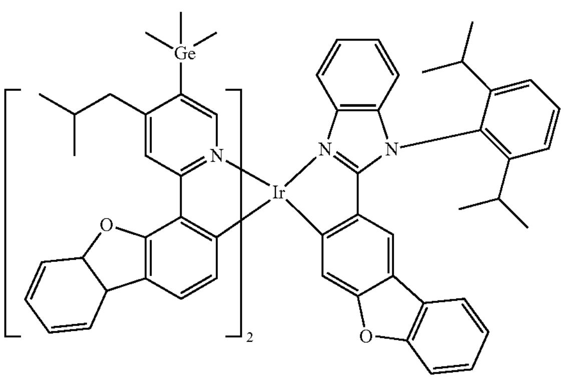
1229
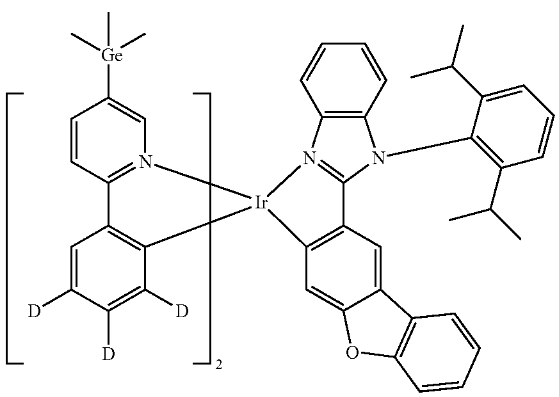
1230
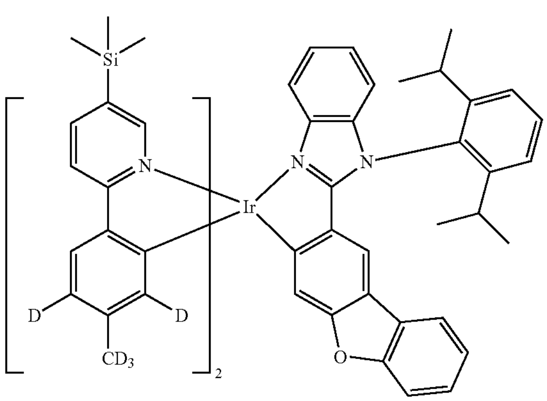
1231
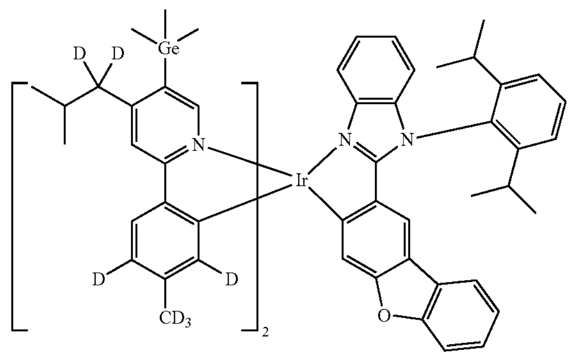
1232
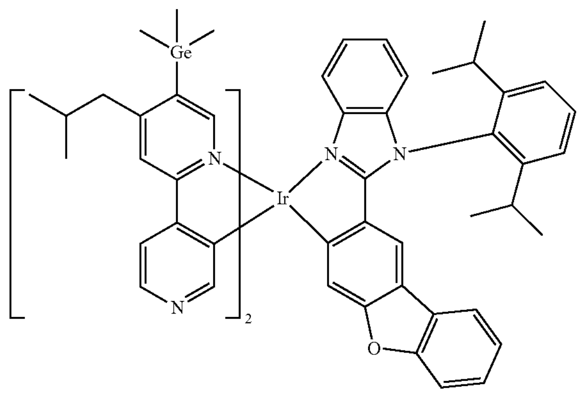
1233
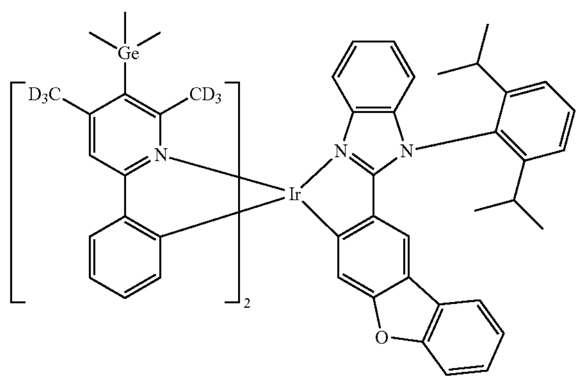
1234
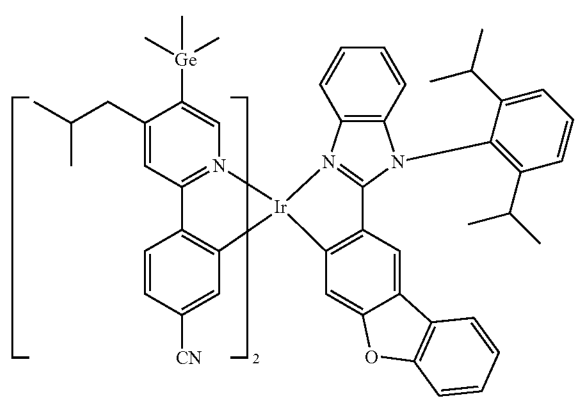

1235
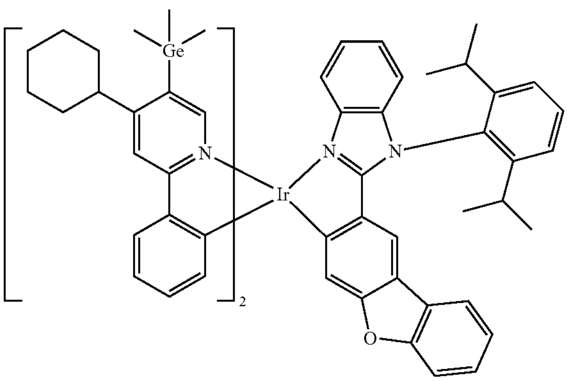
1236
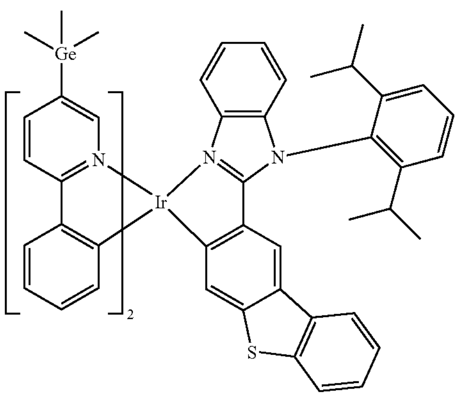
1237
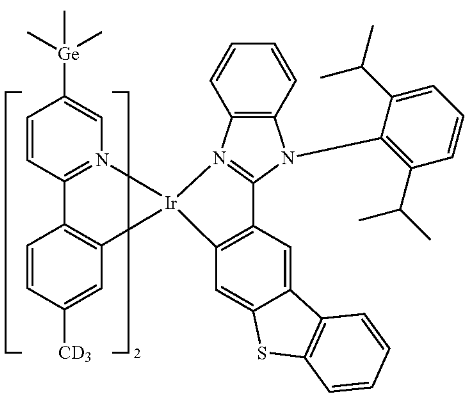
1238
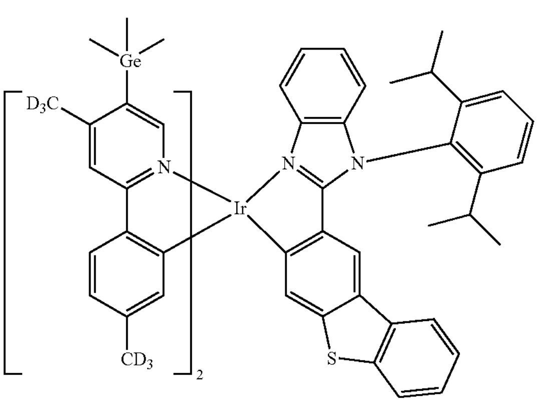
1239
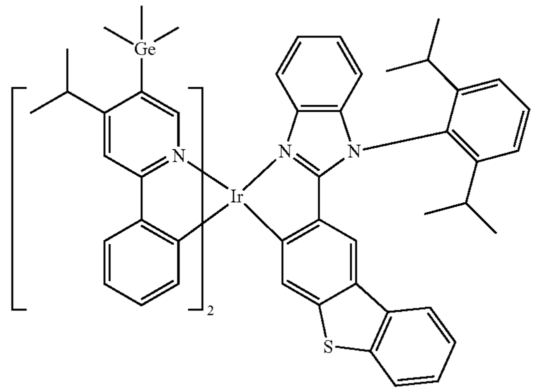
1240
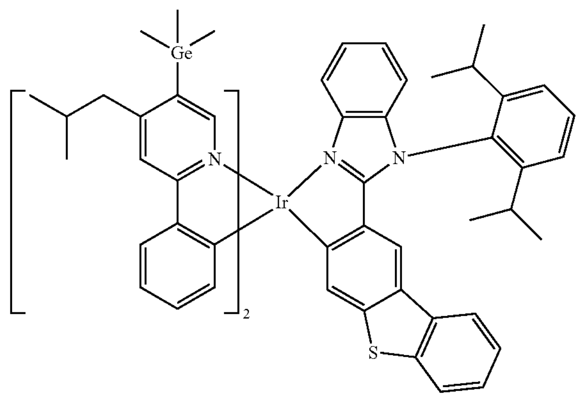
1241
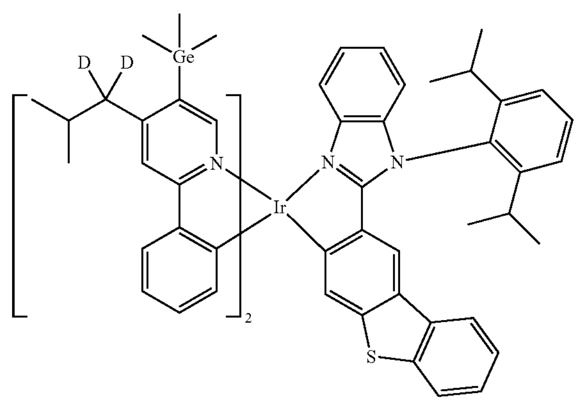
1242
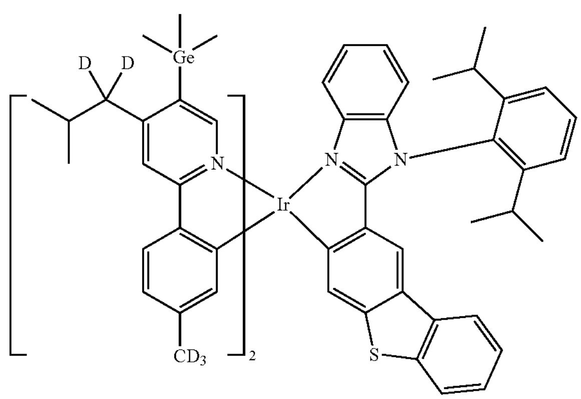

-continued
1243
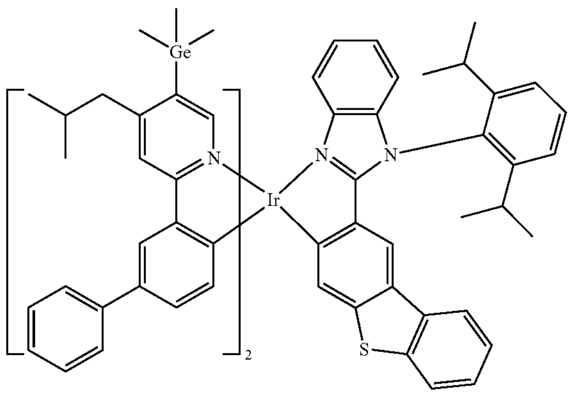
1244
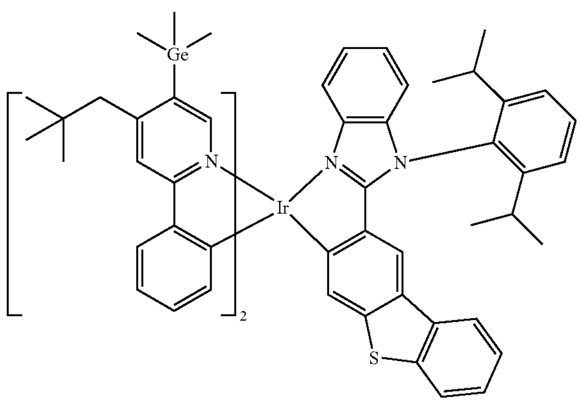
1245
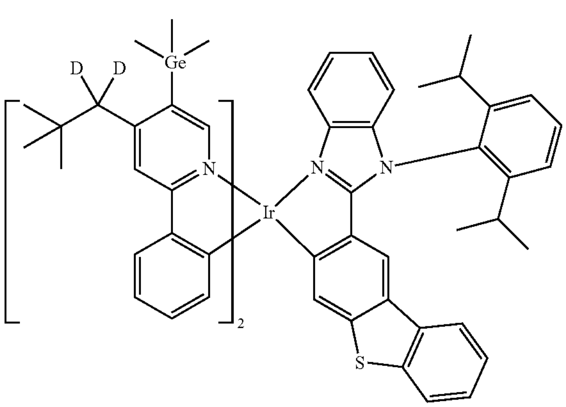
-continued
1246
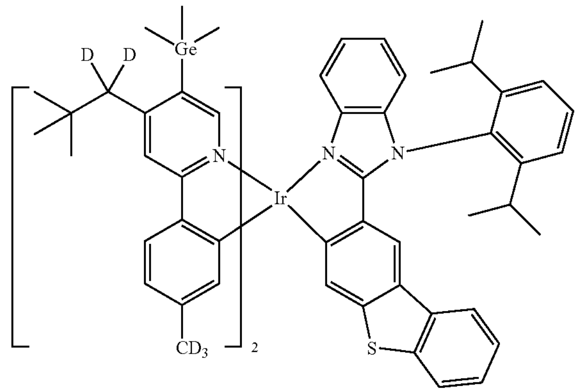
1247
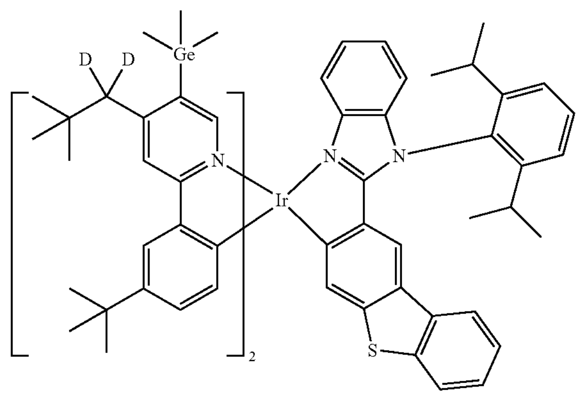
1248
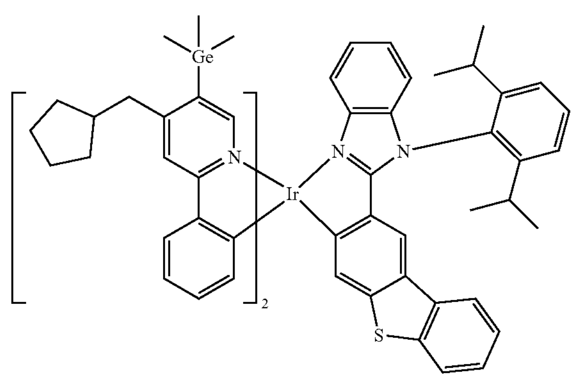
1249
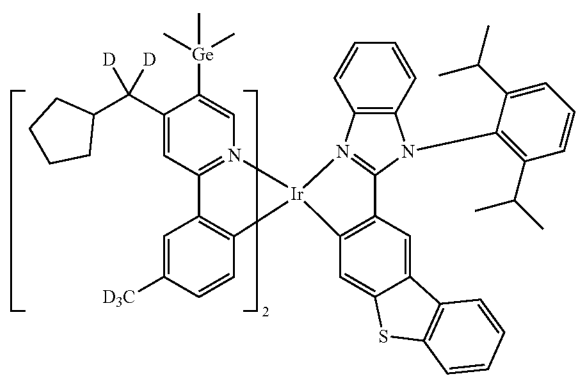

-continued
1250
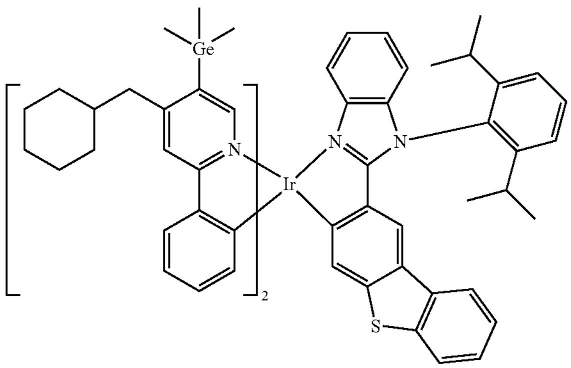
1251
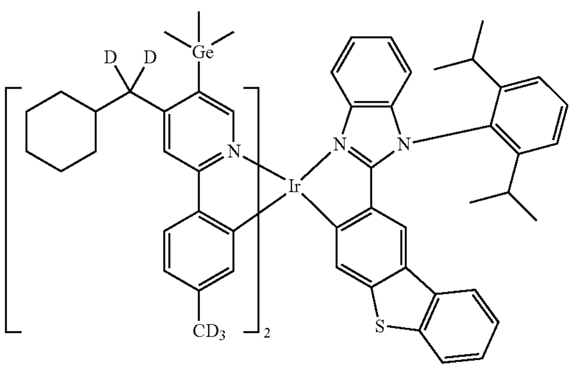
1252
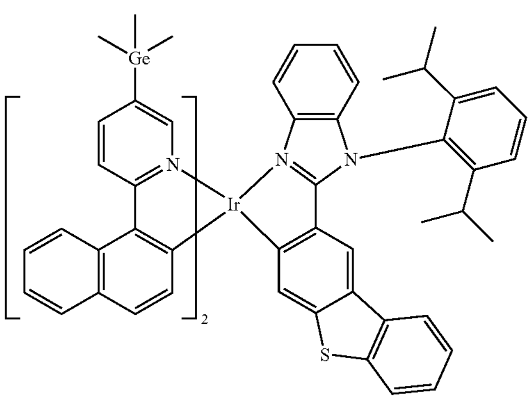
1253
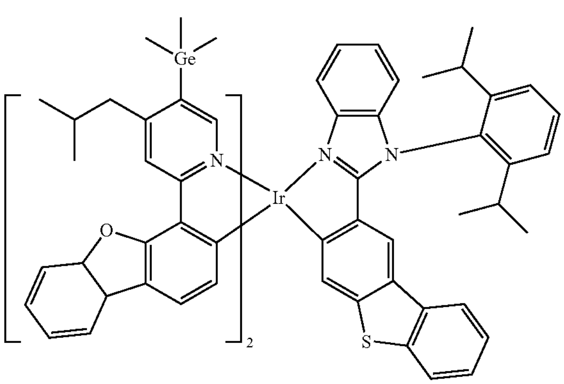
-continued
1254
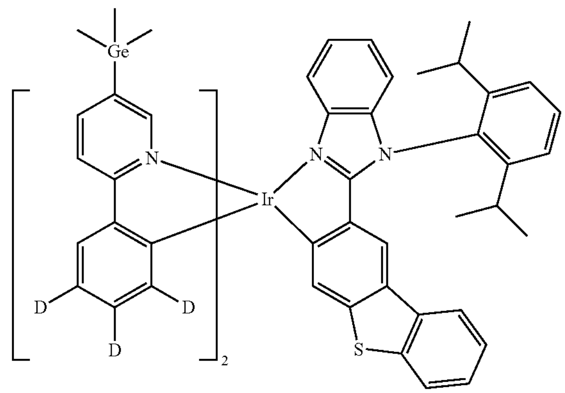
1255
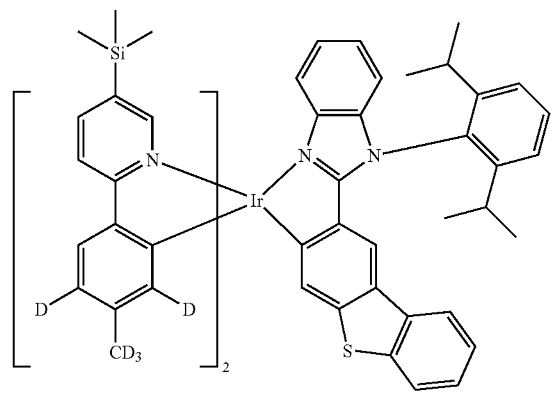
1256
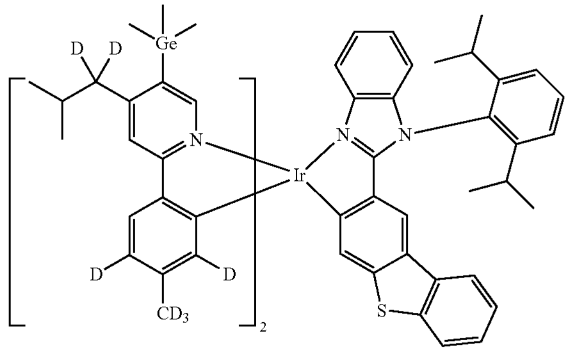
1257
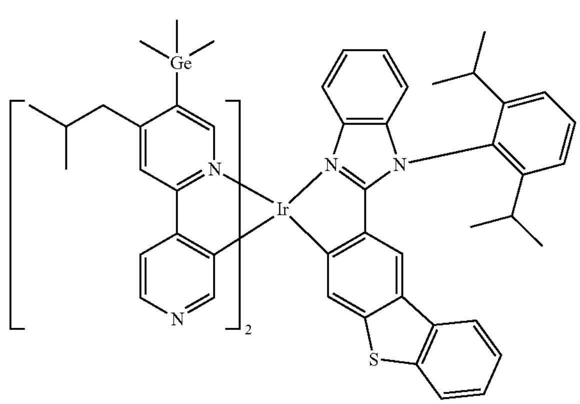

-continued
1258
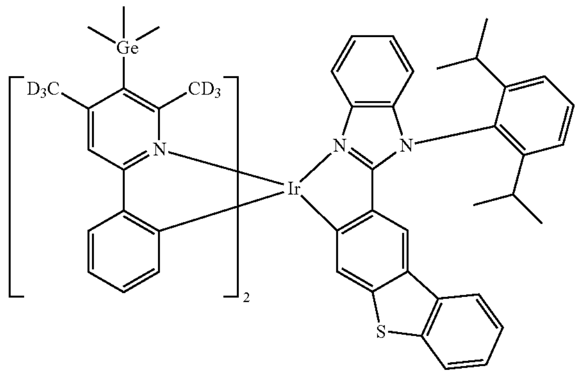
1259
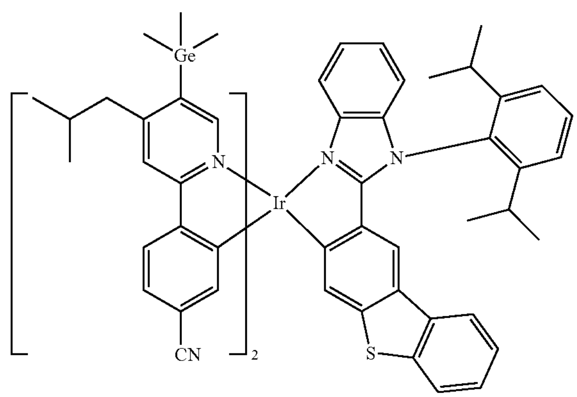
1260
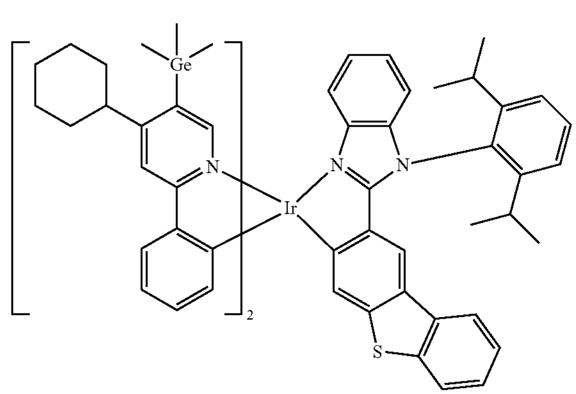
1261
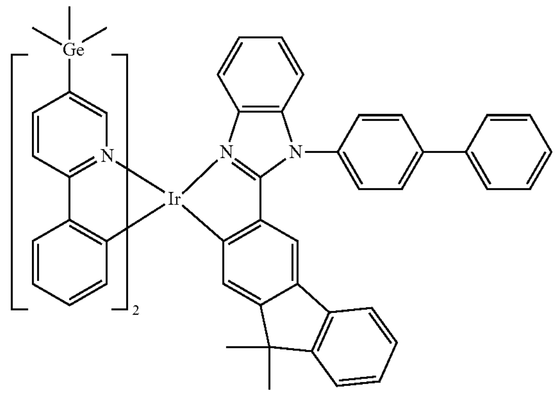
1262
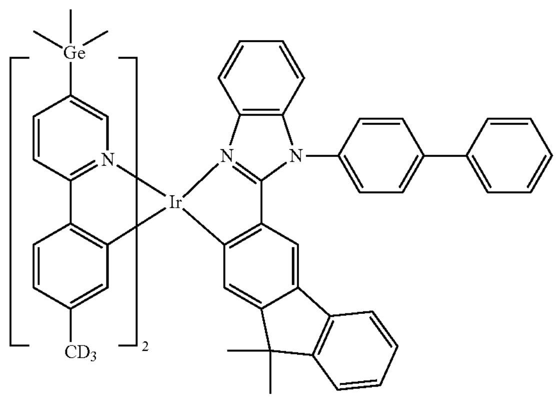
1263
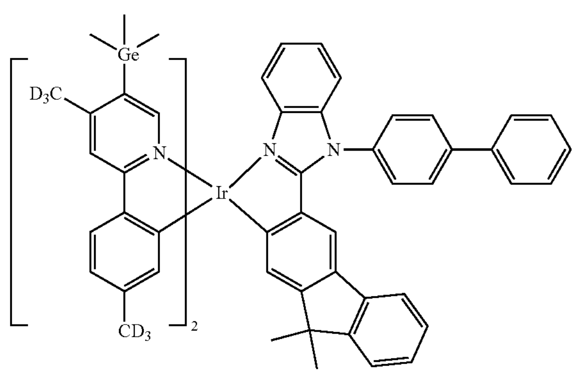
1264
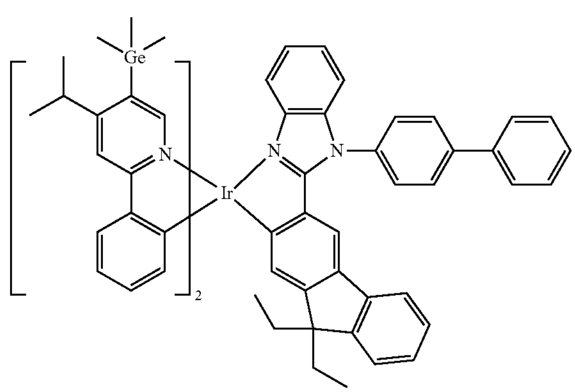

-continued
1265
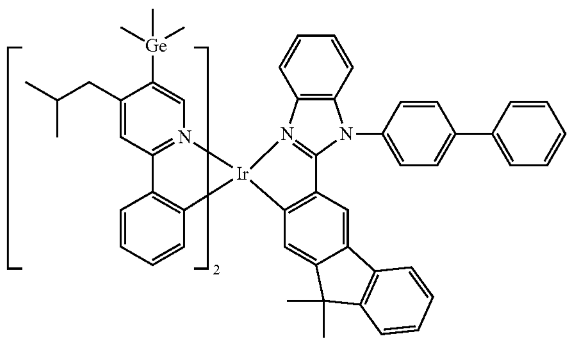
1266
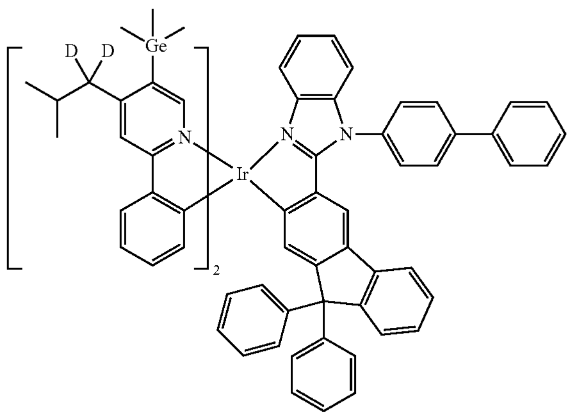
1267
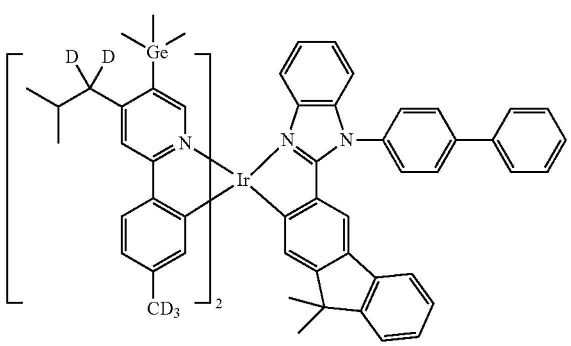
1268
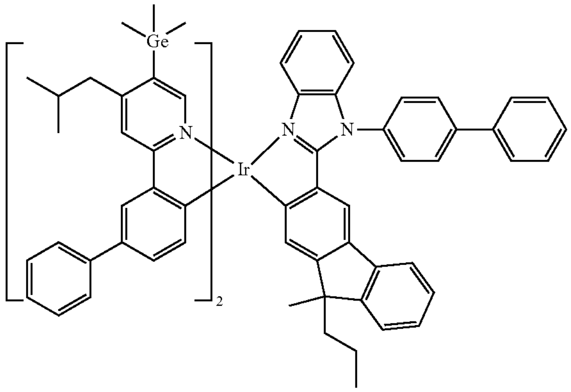
-continued
1269
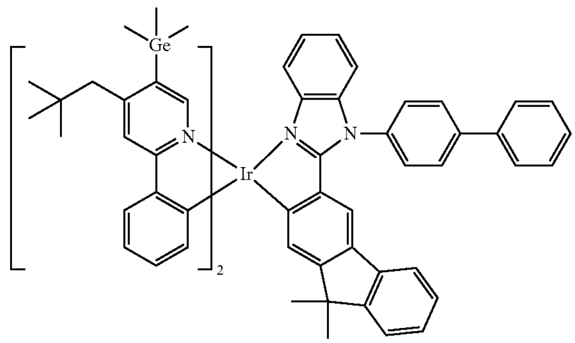
1270
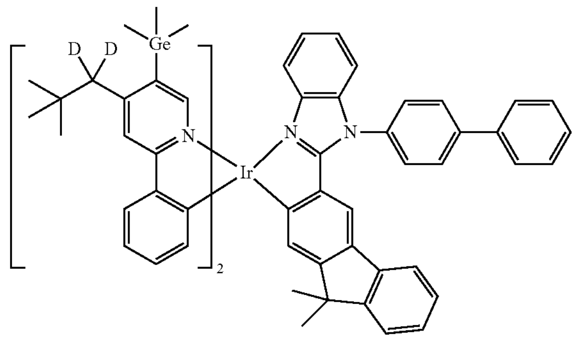
1271
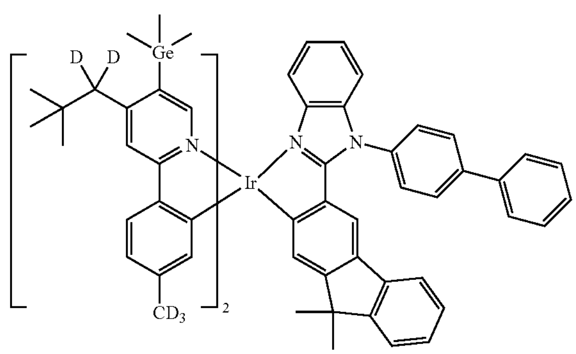
1272
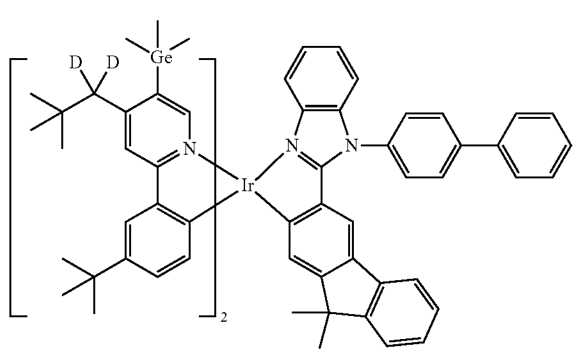

-continued
1273
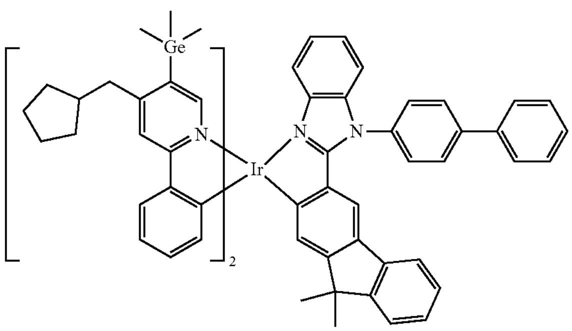
1274
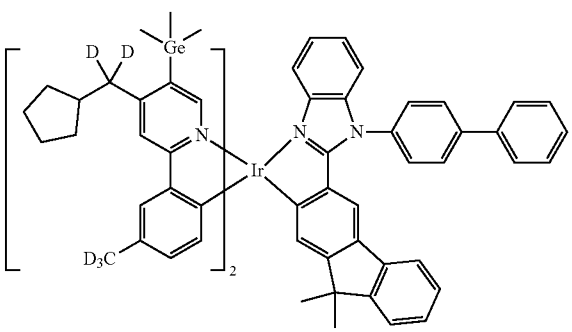
1275
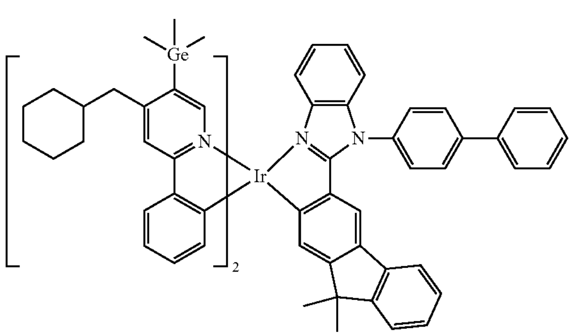
1276
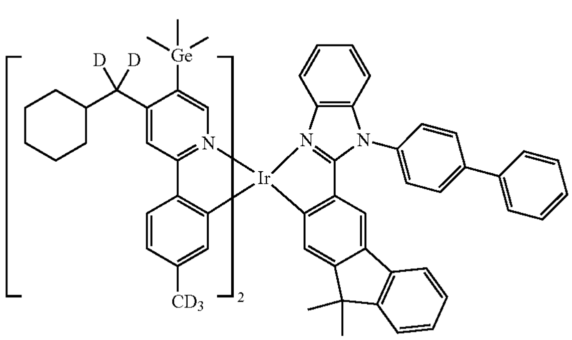
-continued
1277
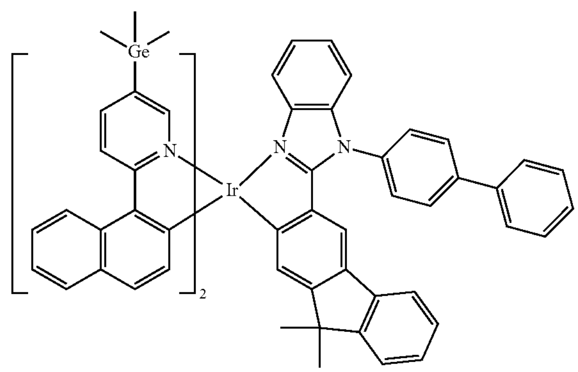
1278
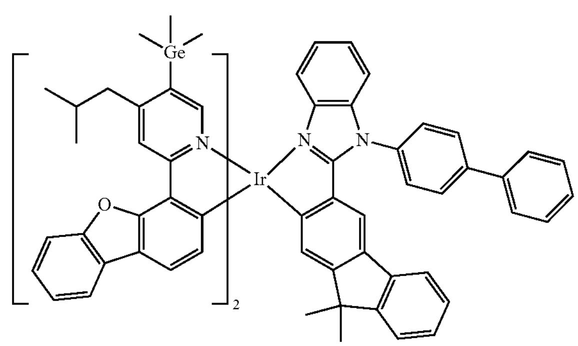
1279
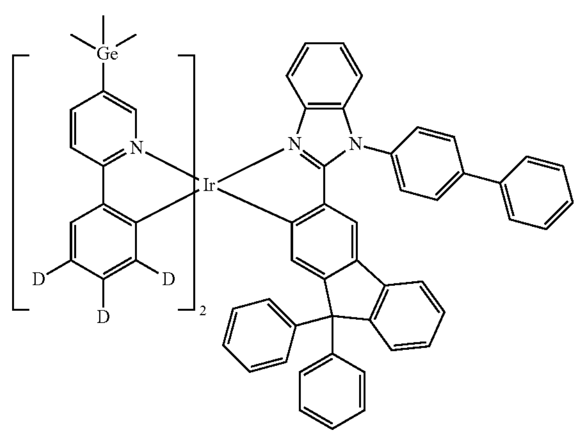
1280
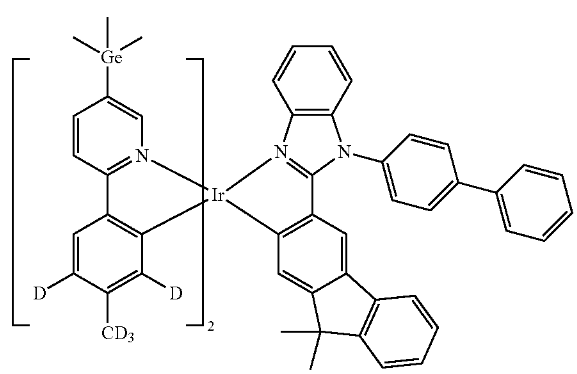

-continued
1281
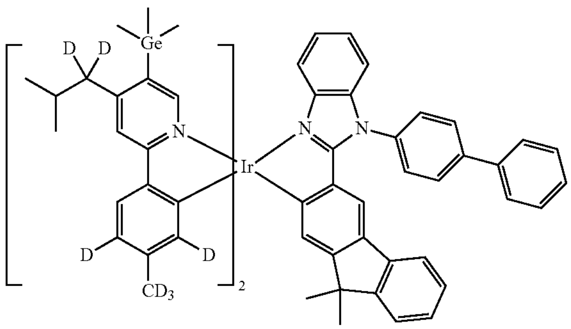
1282
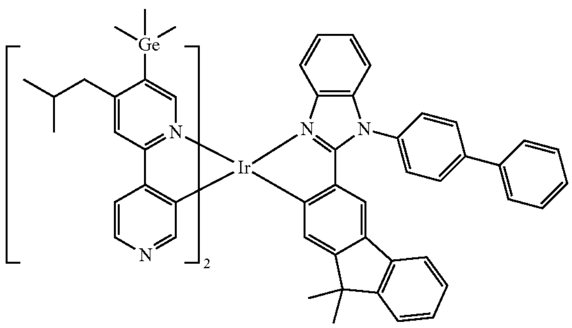
1283
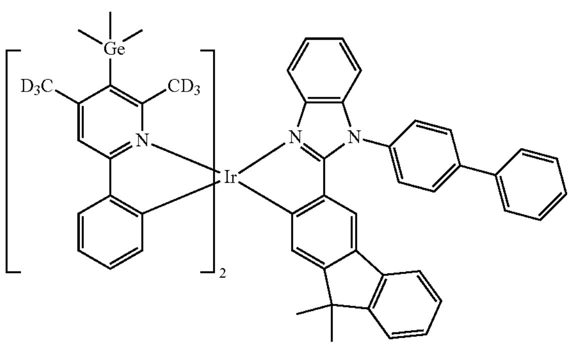
1284
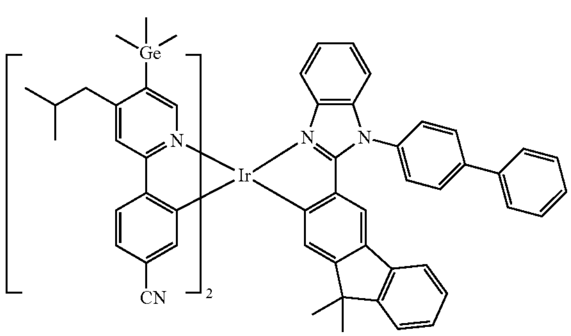
-continued
1285
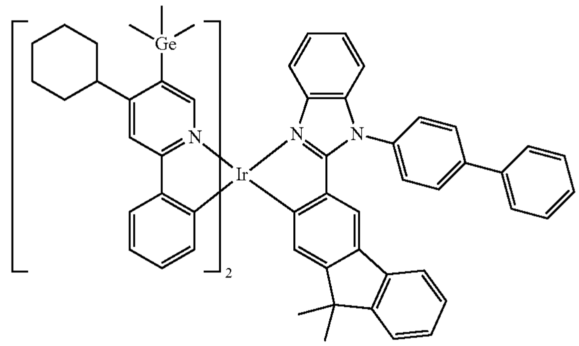
1286
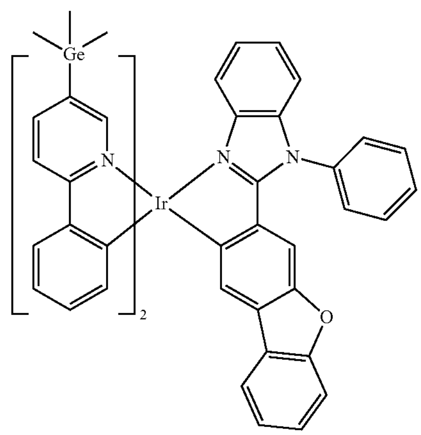
1287
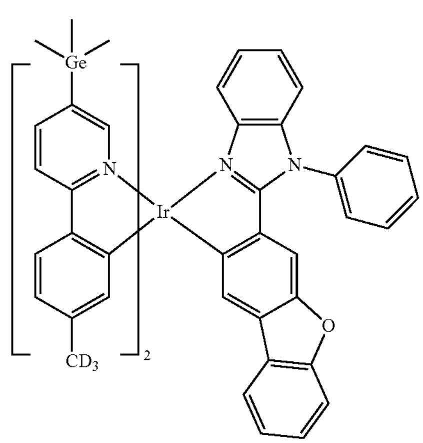

-continued
1288
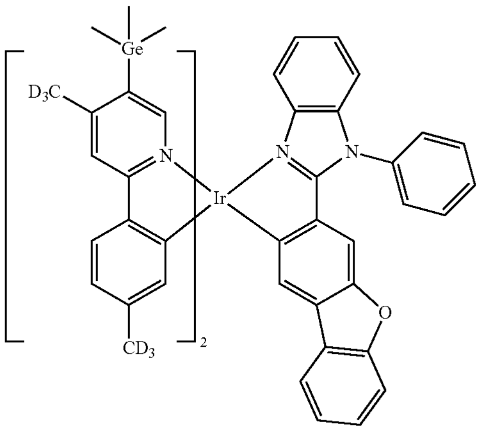
1289
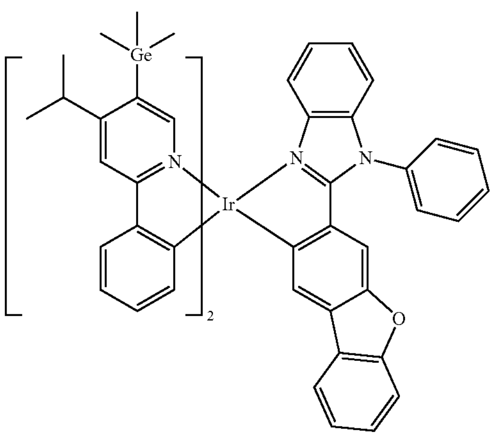
1290
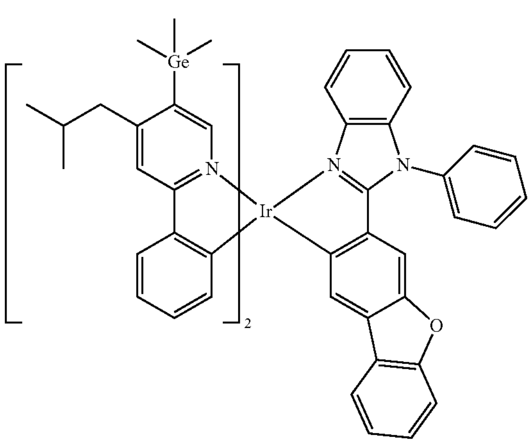
-continued
1291
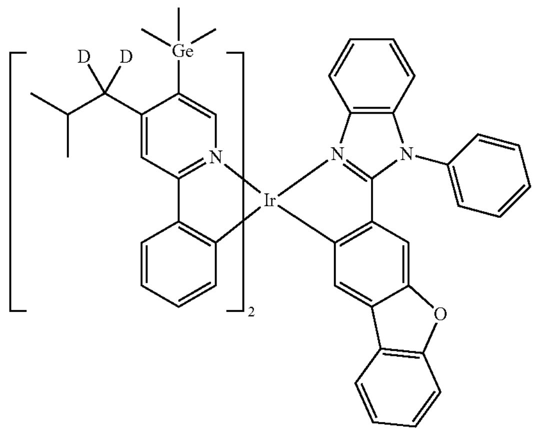
1292
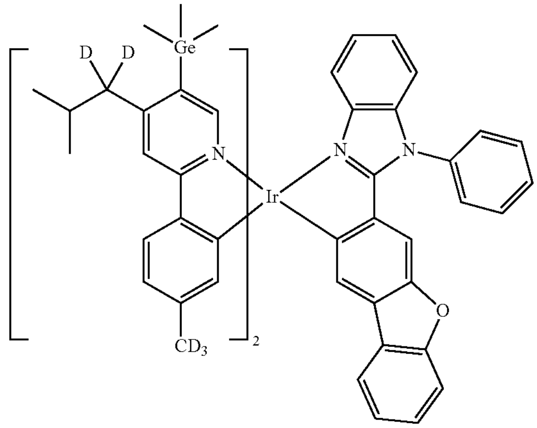
1293
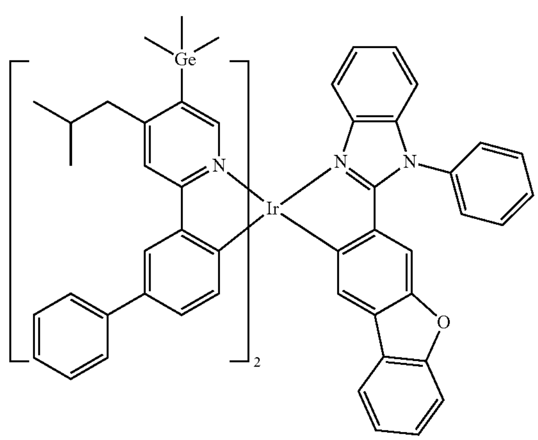

-continued
1294
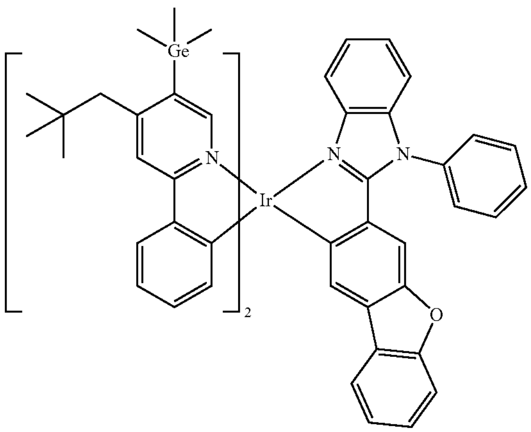
1295
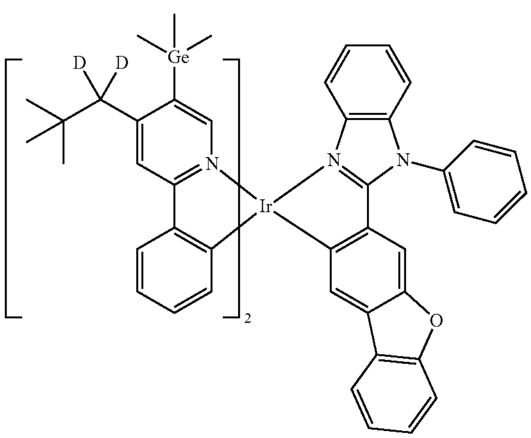
1296
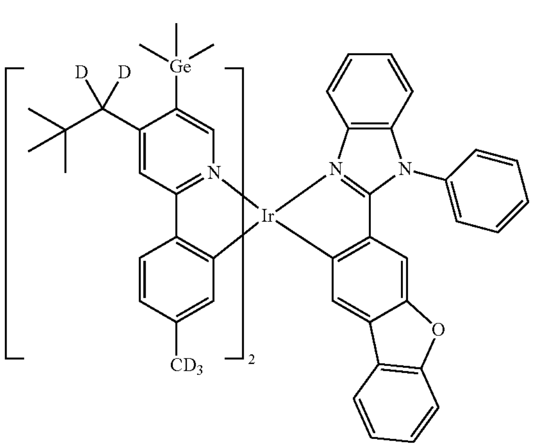
-continued
1297
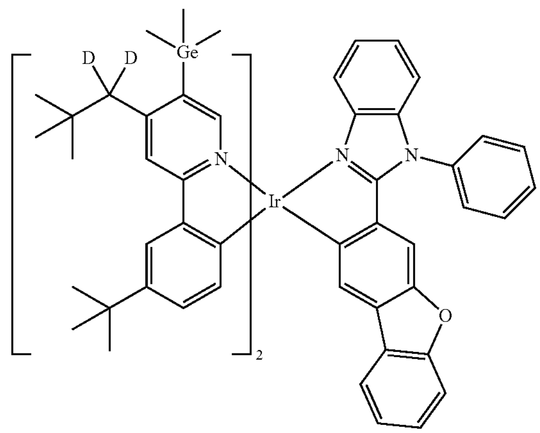
1298
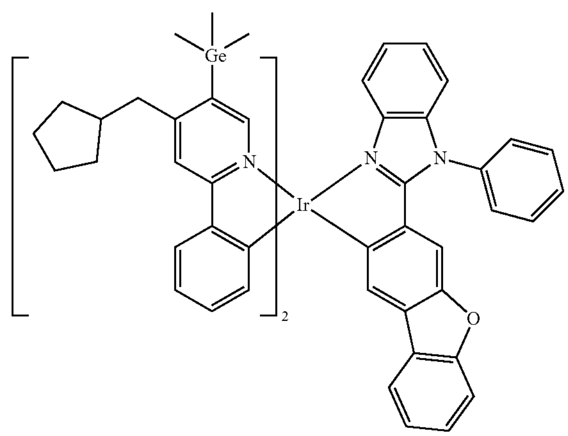
1299
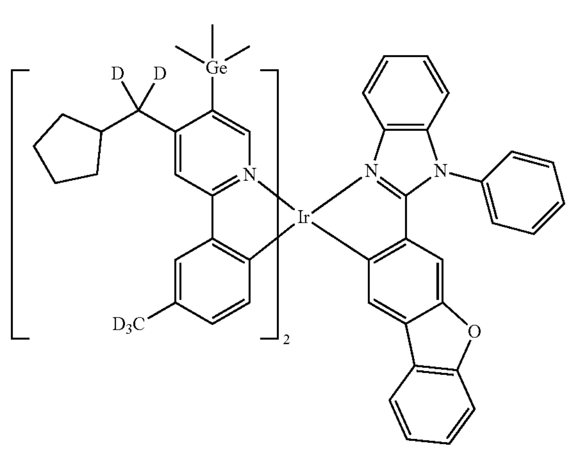

-continued
1300
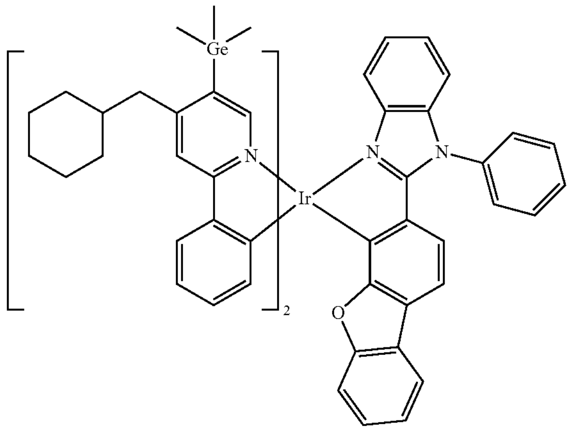
1301
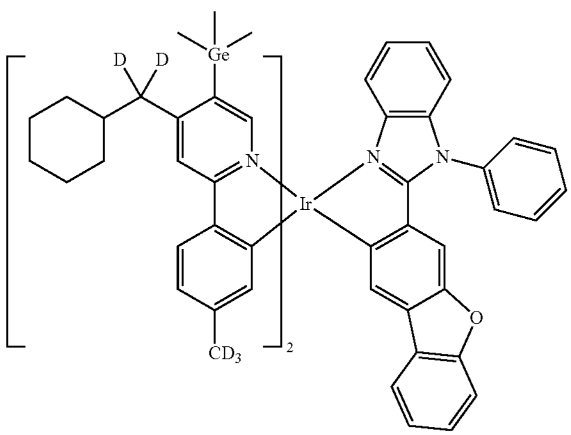
1302
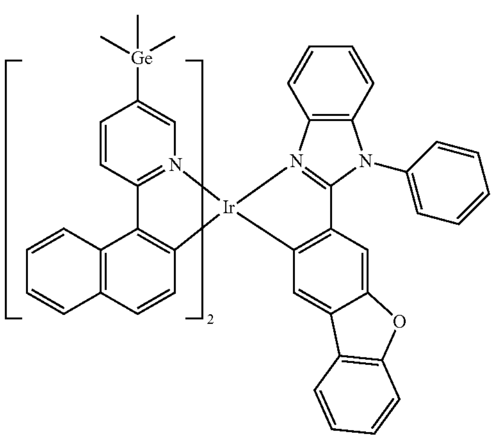
-continued
1303
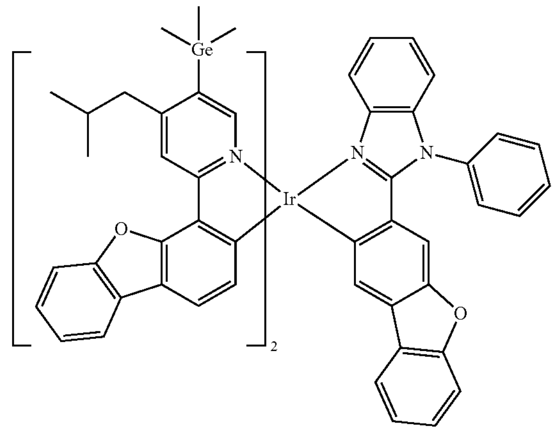
1304
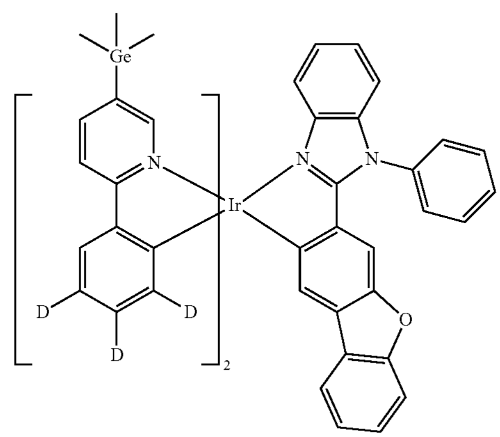
1305
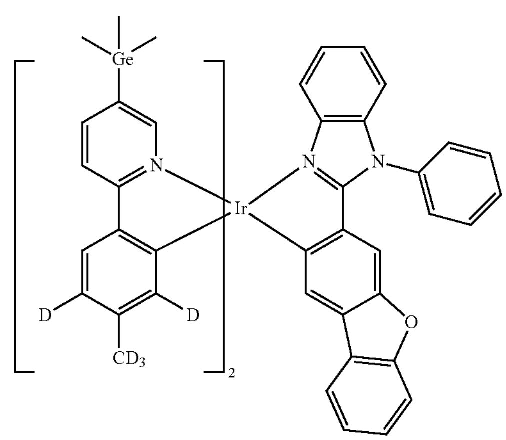

-continued
1306
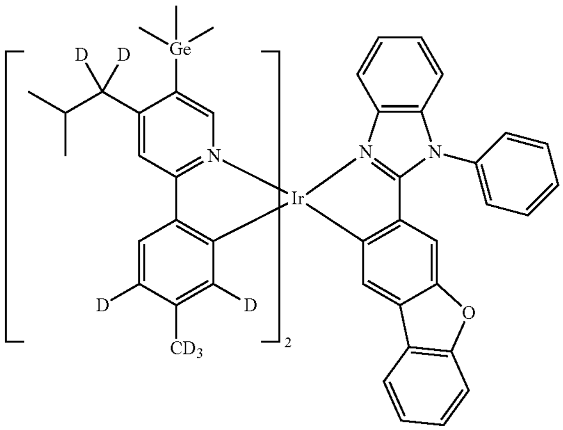
1307
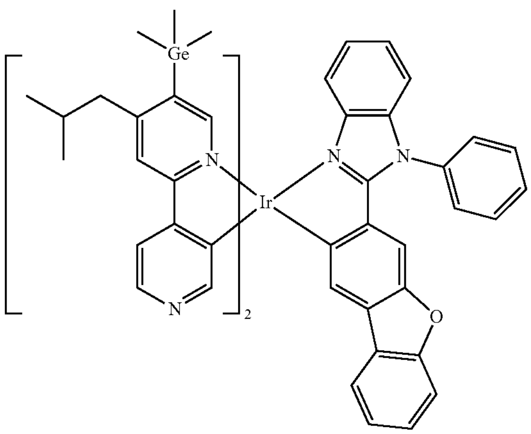
1308
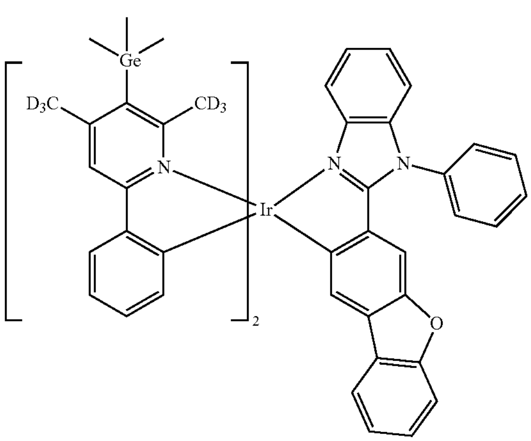
-continued
1309
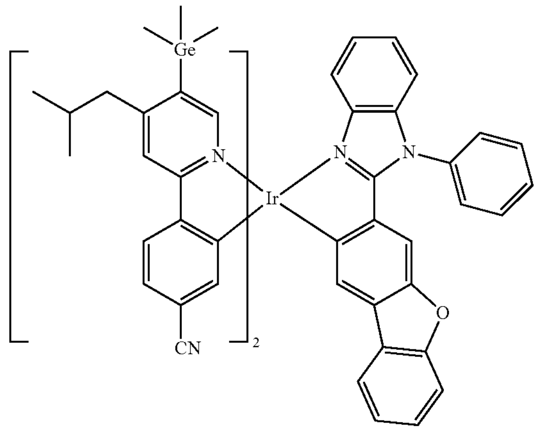
1310
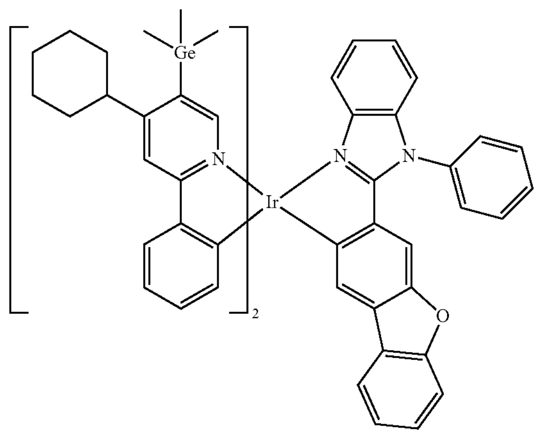
1311
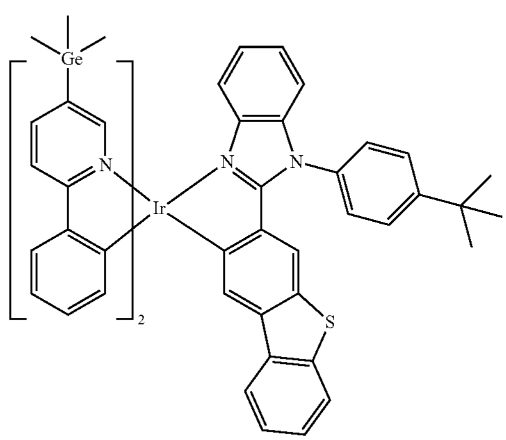

-continued
1312
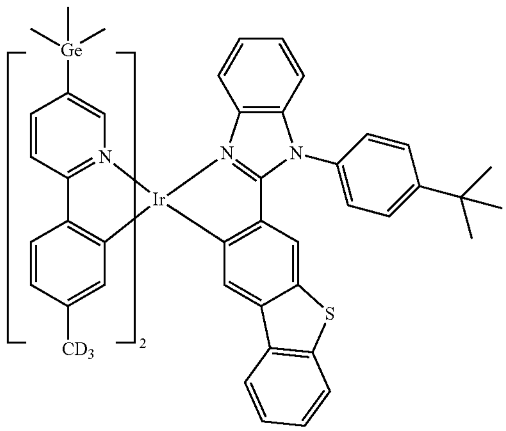
1313
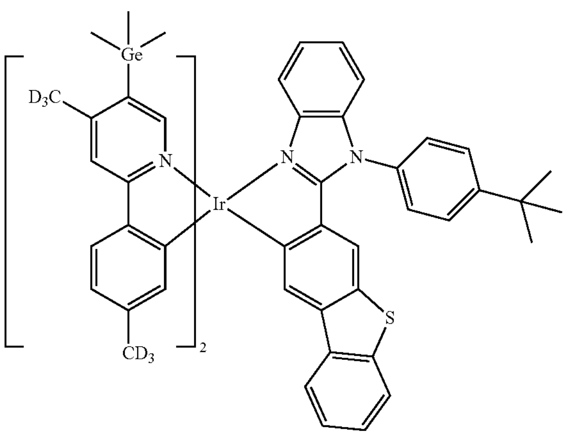
1314
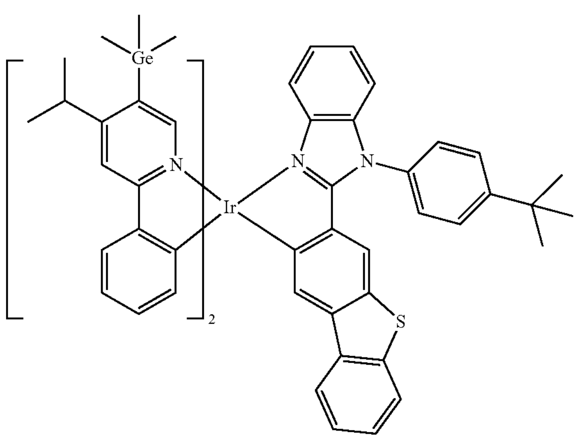
-continued
1315
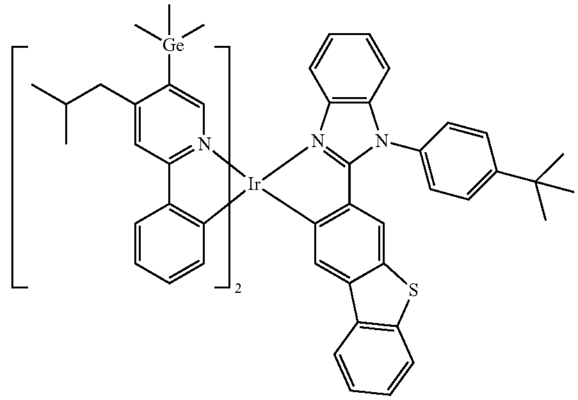
1316
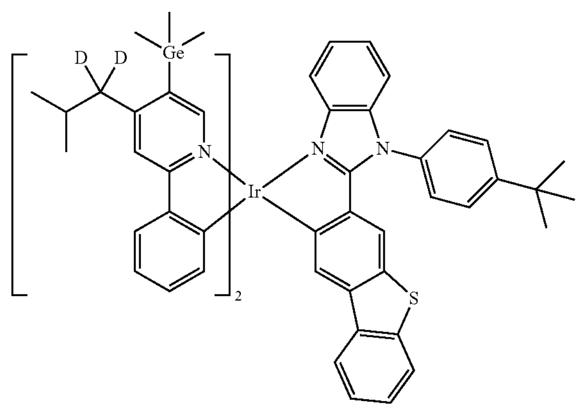
1317
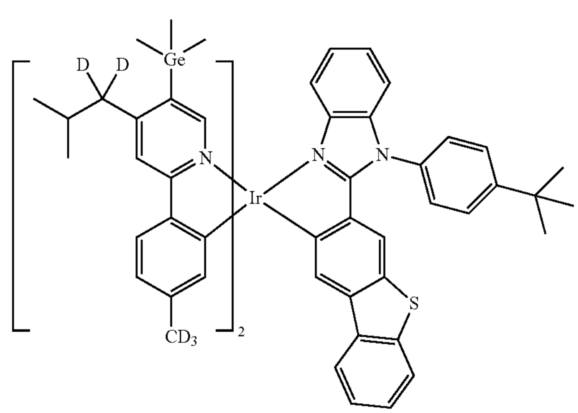

-continued
1318
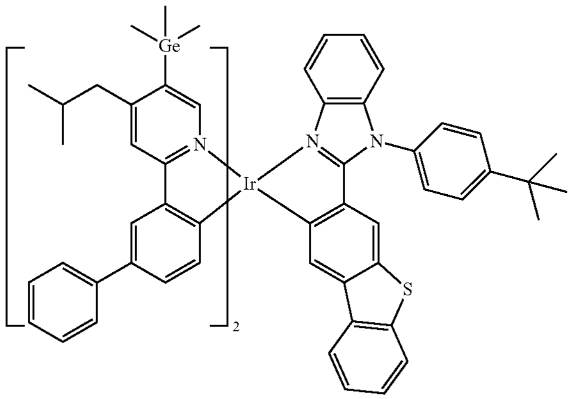
1319
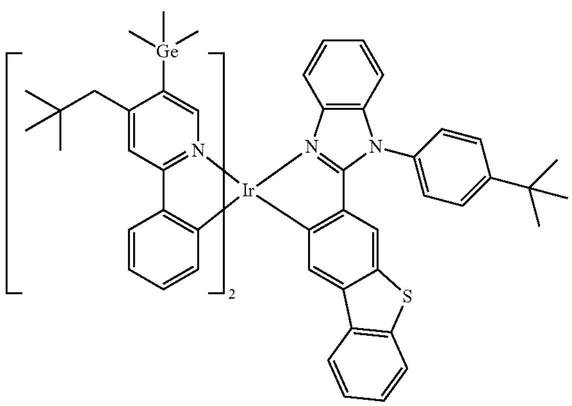
1320
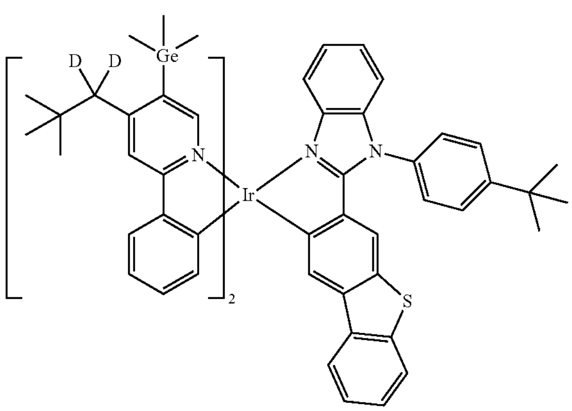
-continued
1321
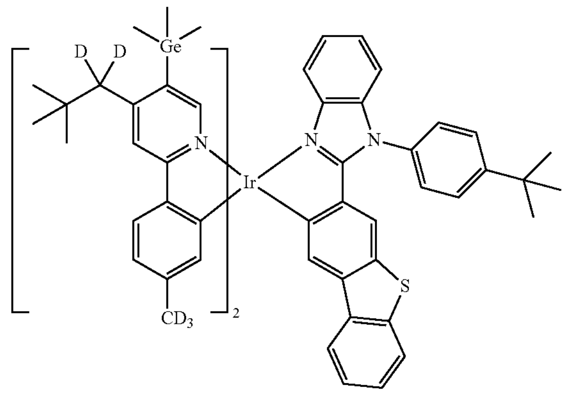
1322
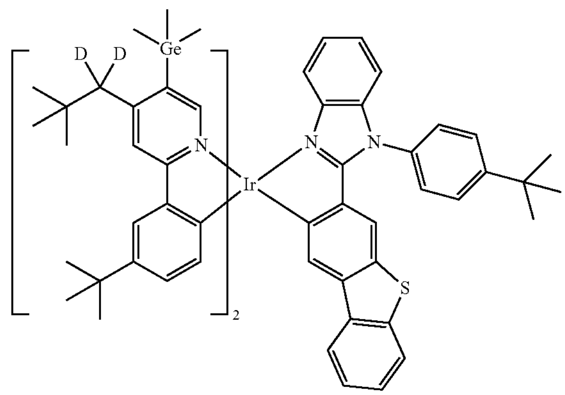
1323
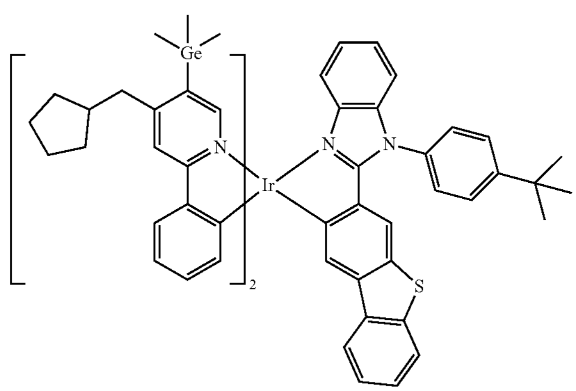
1324
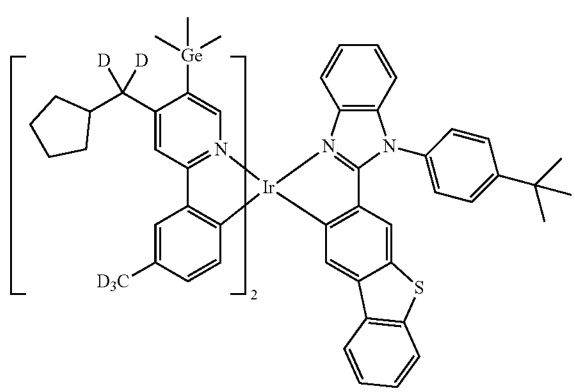

-continued
1325
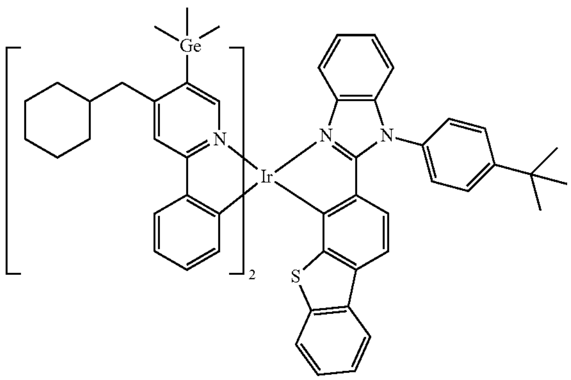
1326
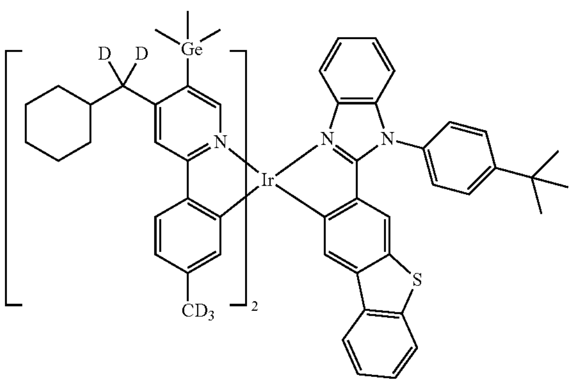
1327
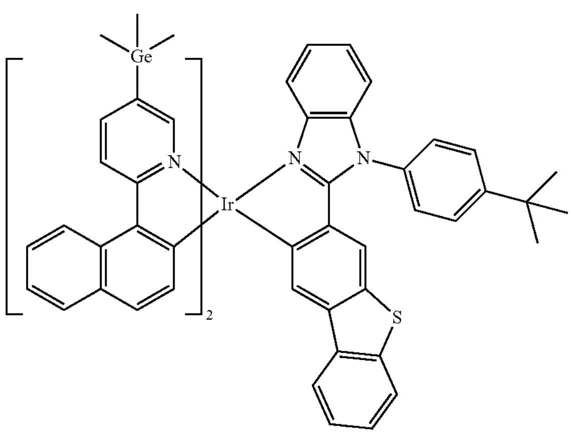
1328
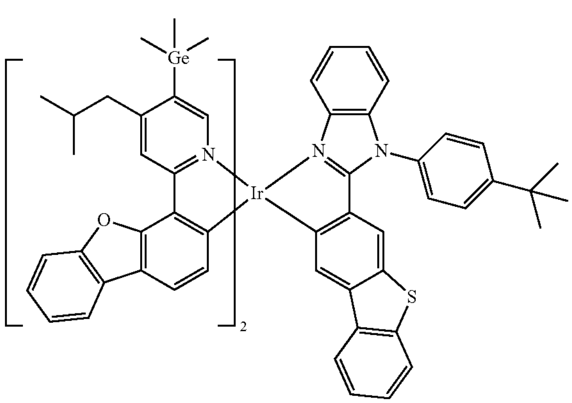
-continued
1329
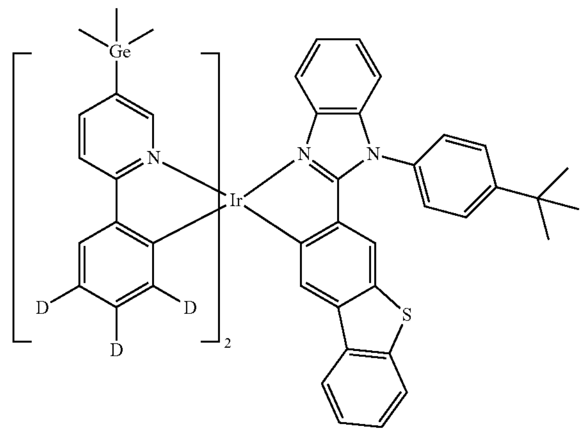
1330
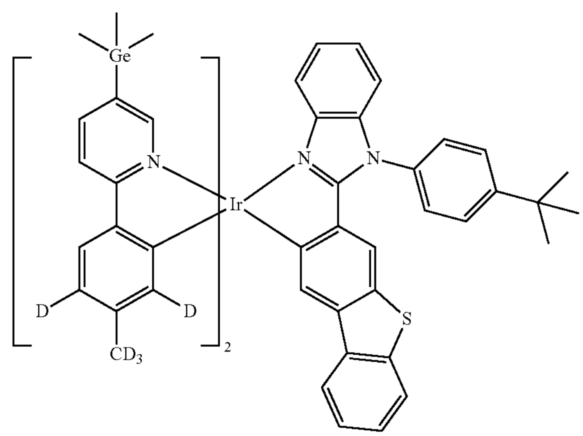
1331
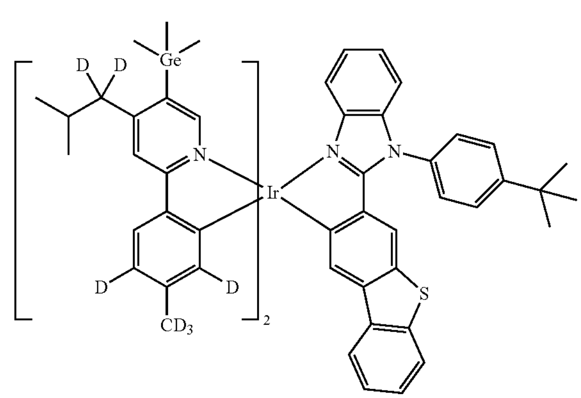

-continued
1332
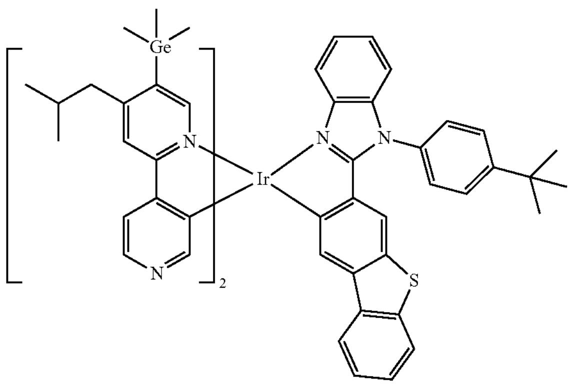
1333
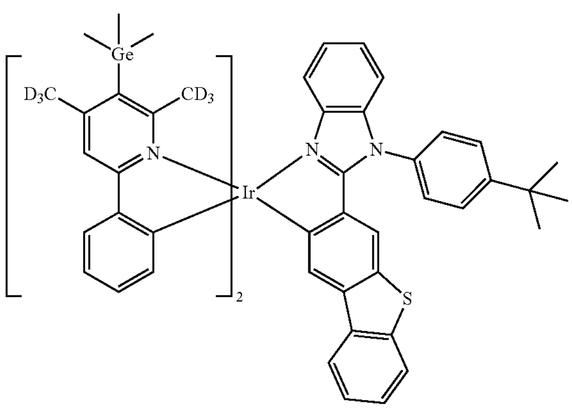
1334
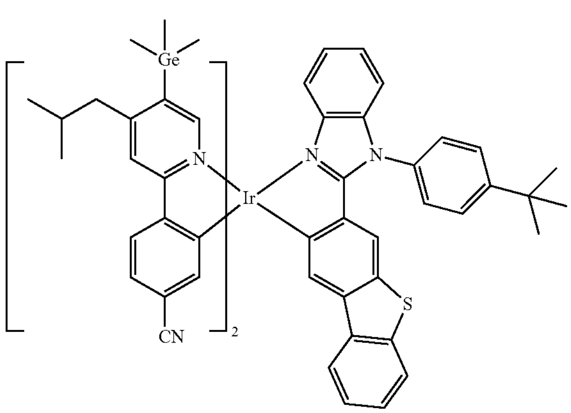
-continued
1335
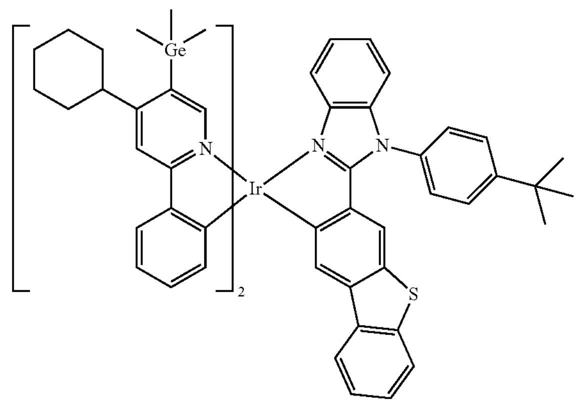
1336
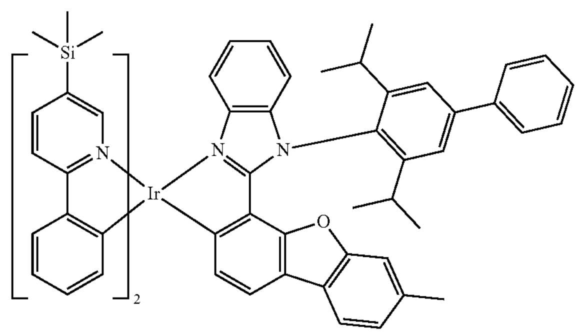
1337
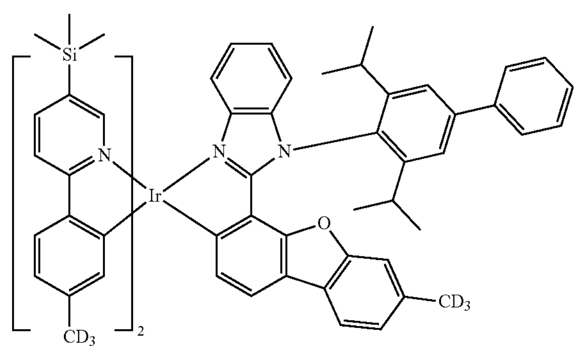
1338
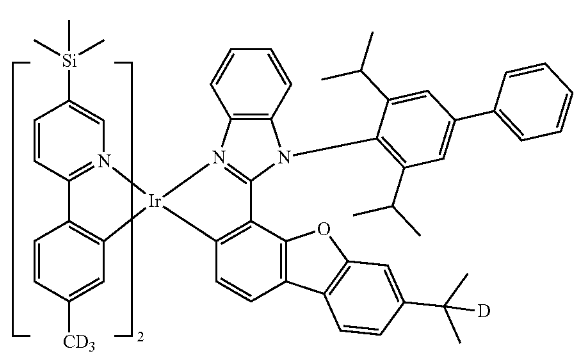

1339
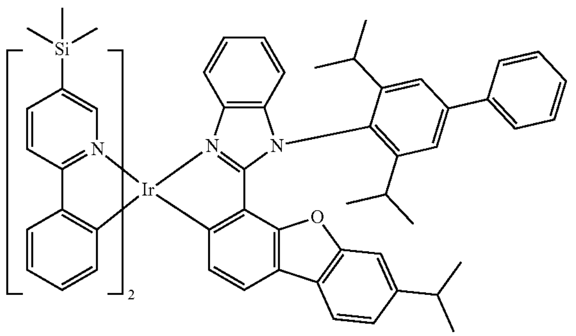
1340
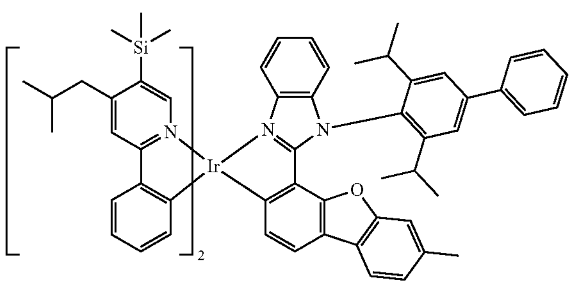
1341
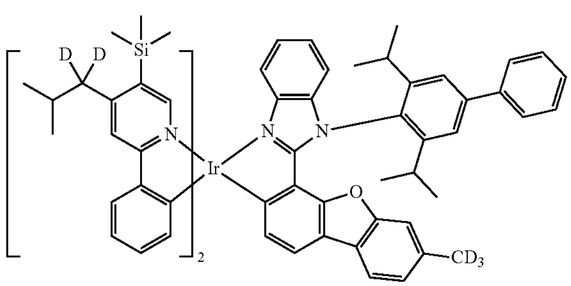
1342
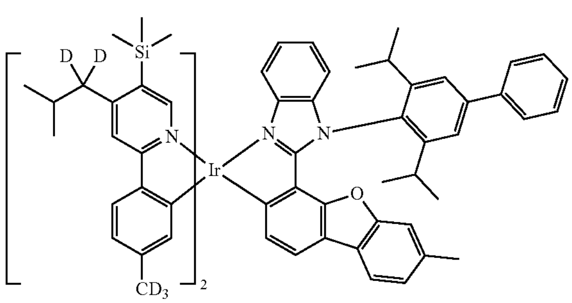
1343
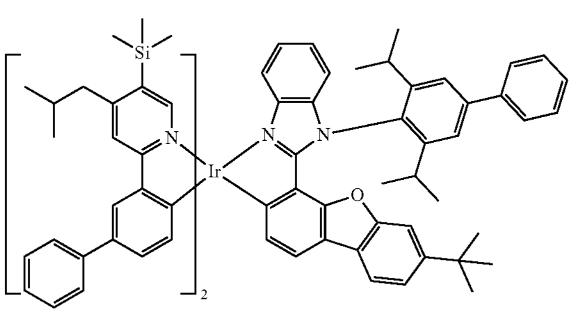
1344
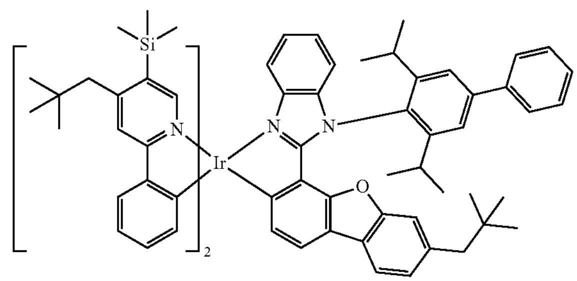
1345
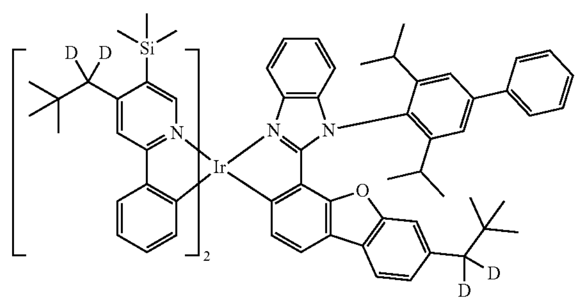
1346
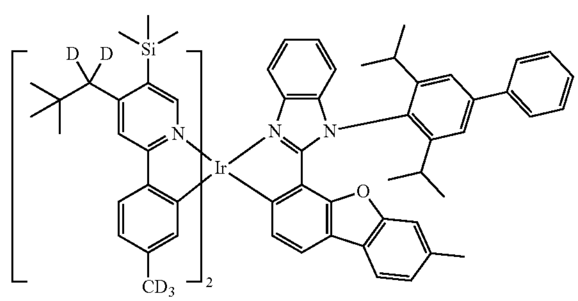
1347
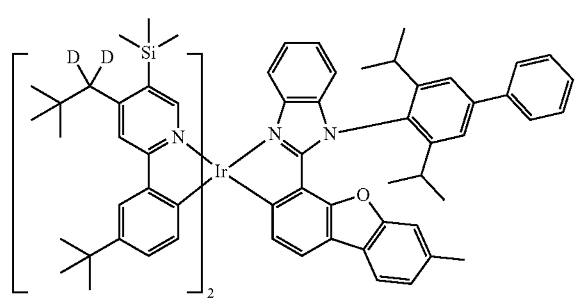
1348
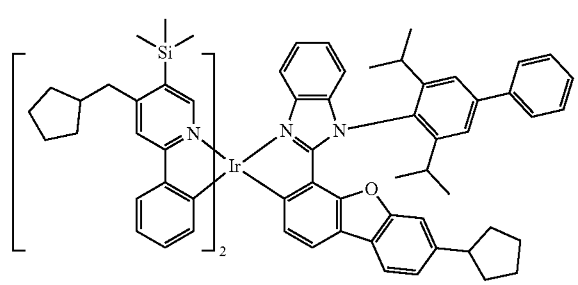

-continued
1349
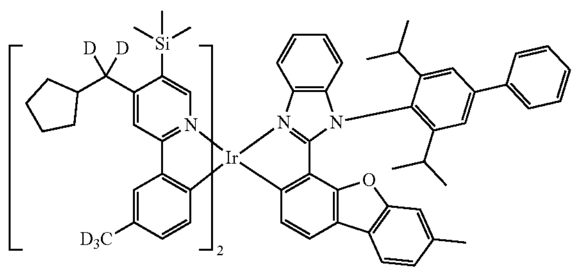
1350
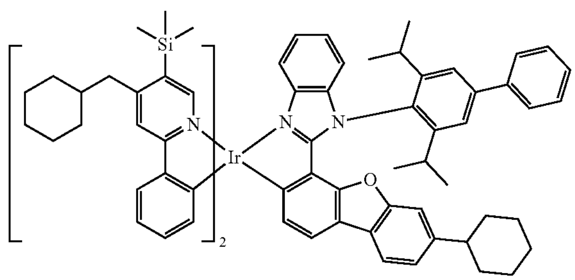
1351
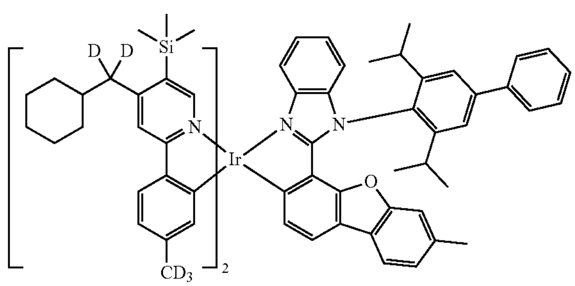
1352
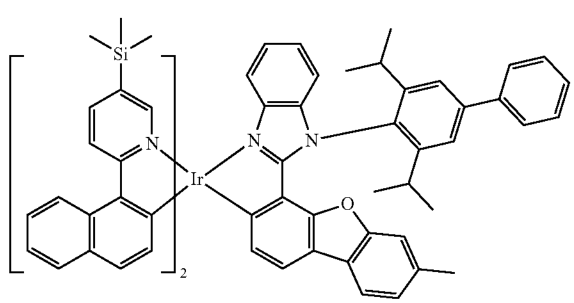
1353
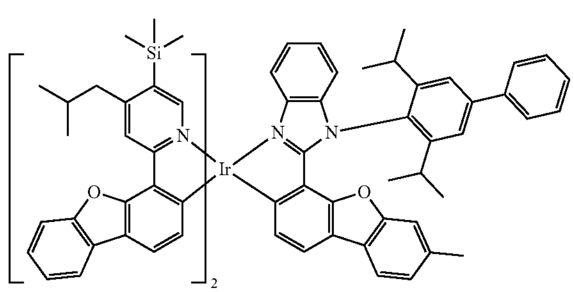
-continued
1354
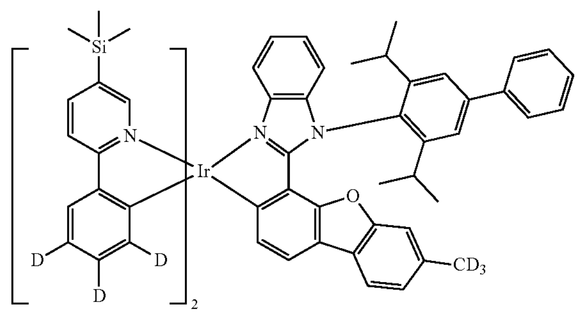
1355
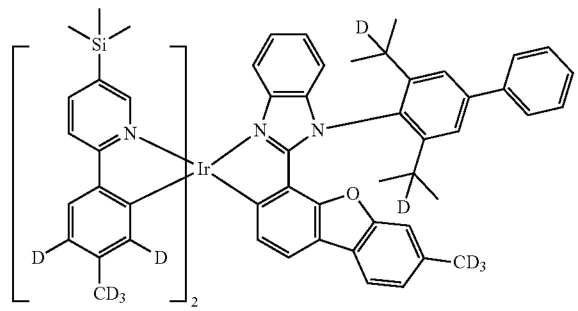
1356
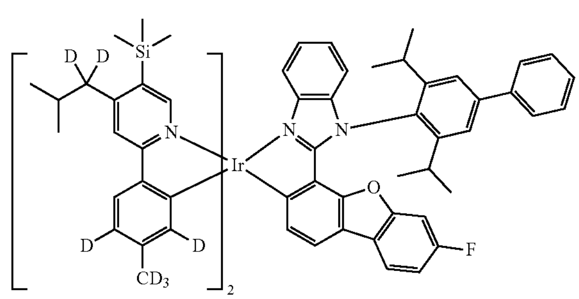
1357
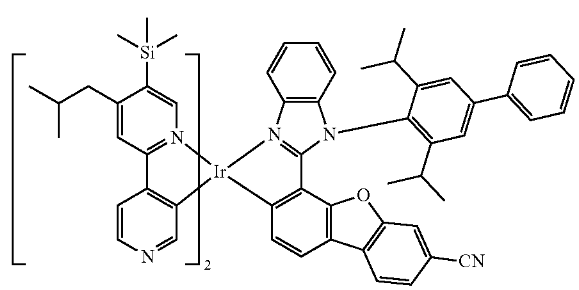
1358
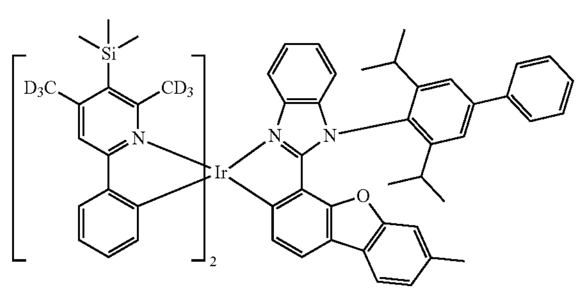

-continued
1359
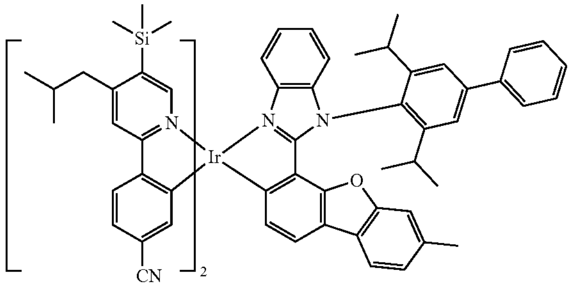
1360
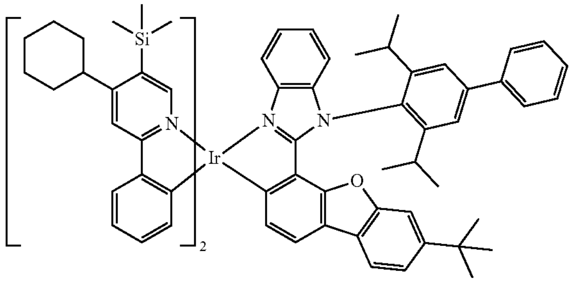
1361
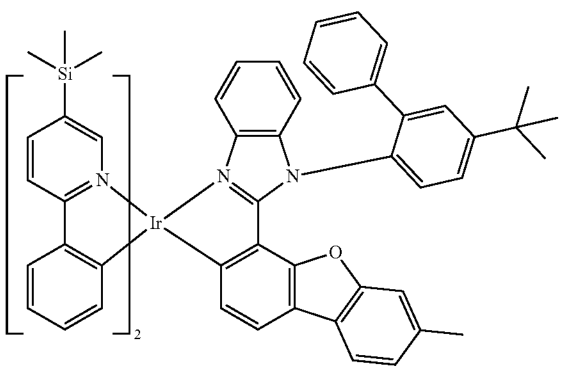
1362
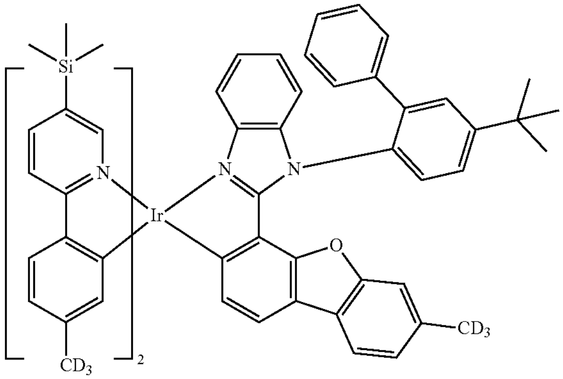
-continued
1363
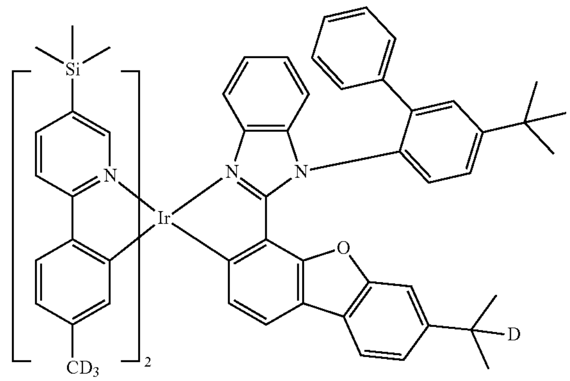
1364
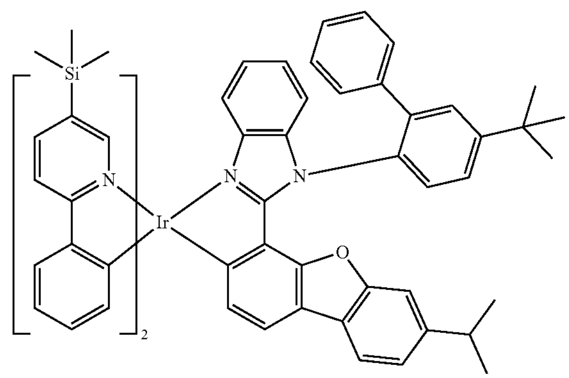
1365
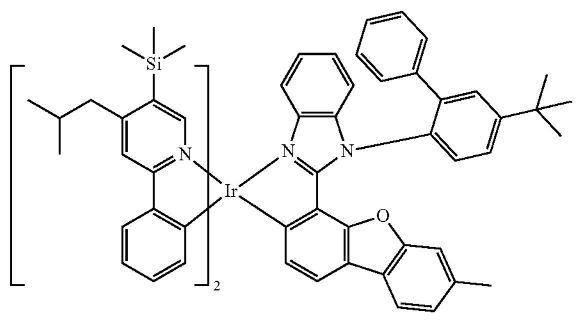
1366
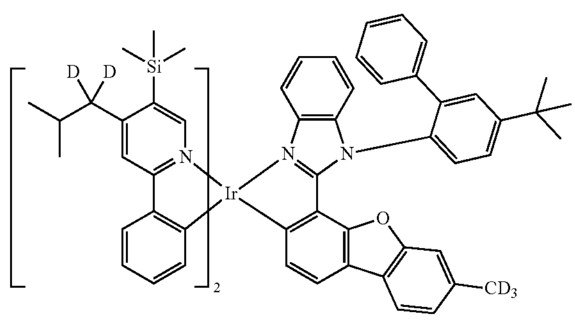

1367
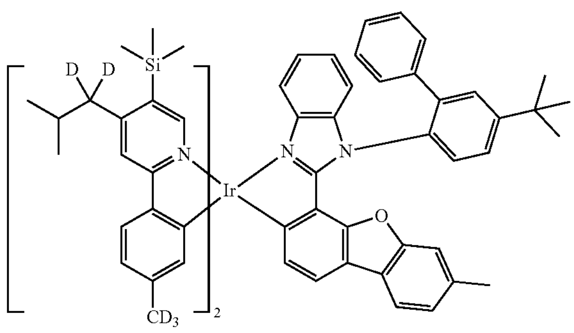
1368
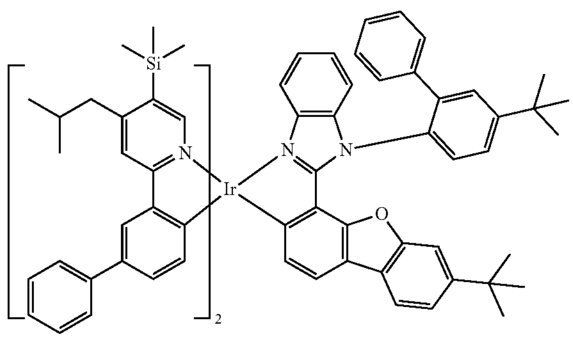
1369
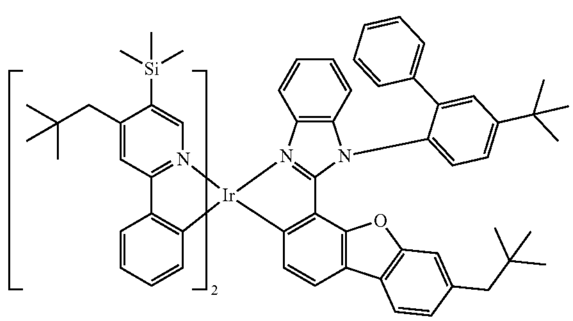
1370
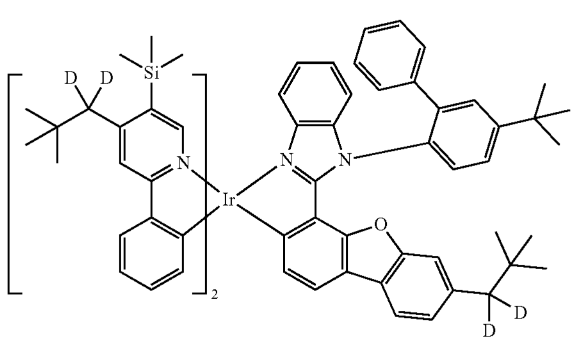
1371
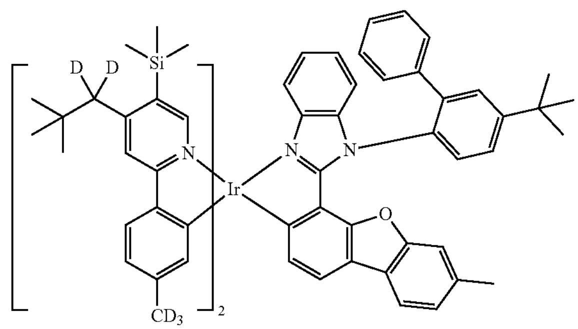
1372
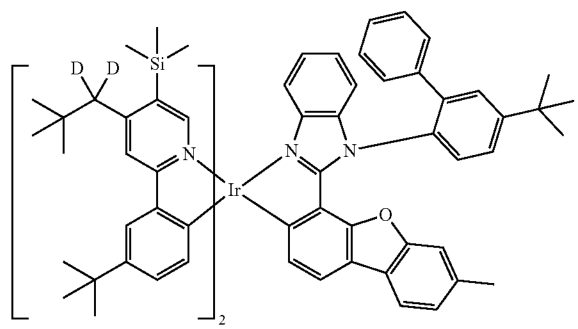
1373
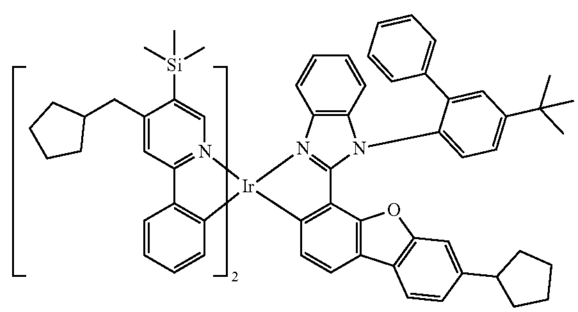
1374
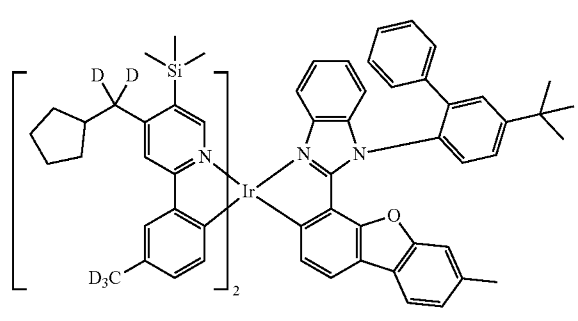

-continued
1375
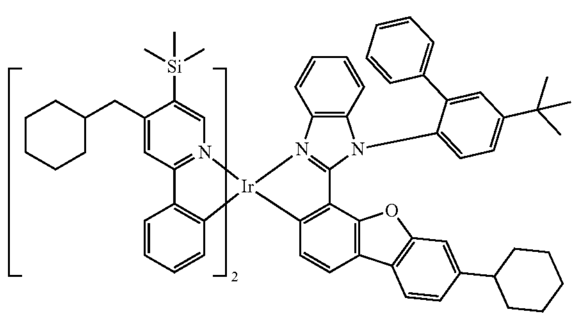
1376
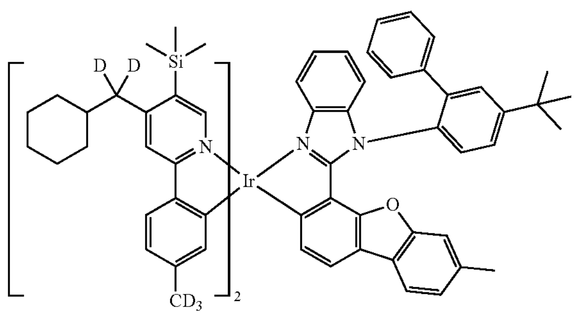
1377
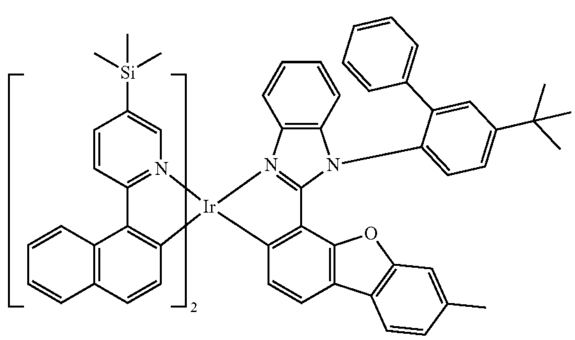
1378
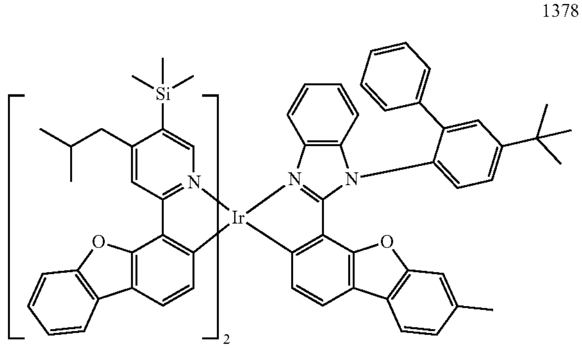
-continued
1379
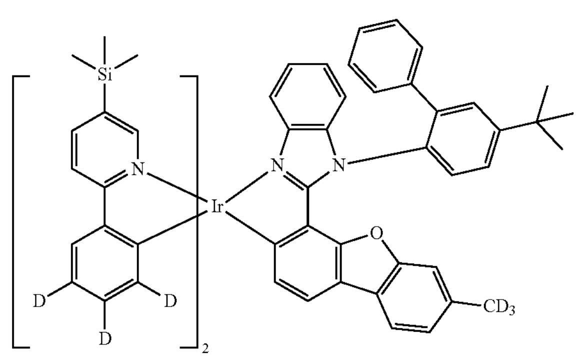
1380
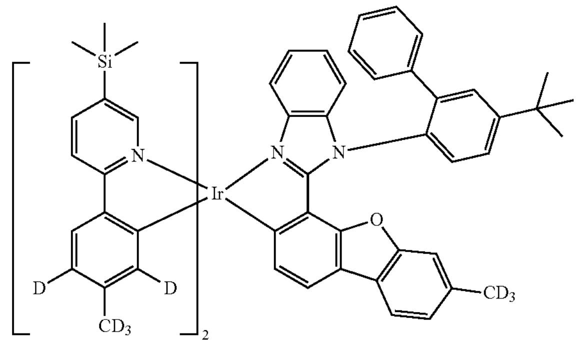
1381
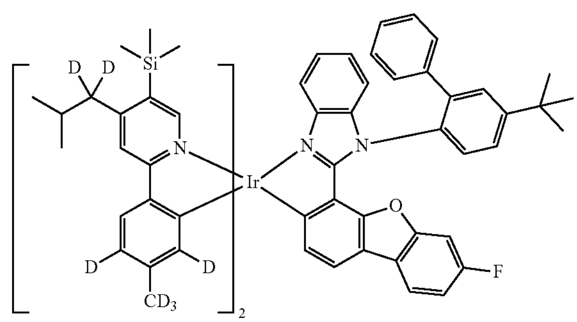
1382
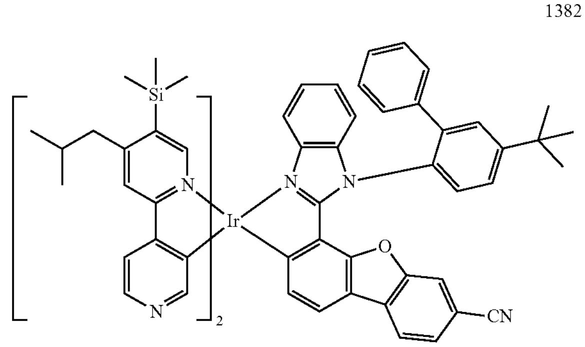

-continued
1383
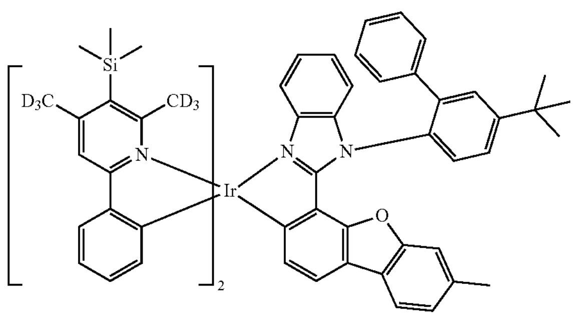
1384
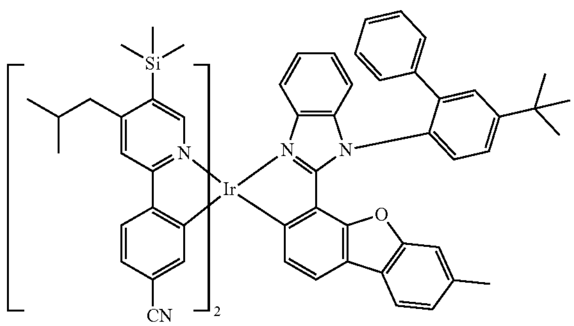
1385
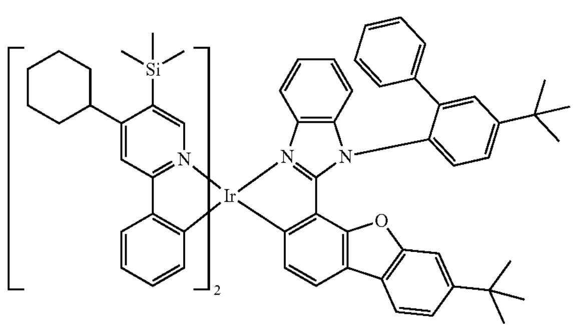
1386
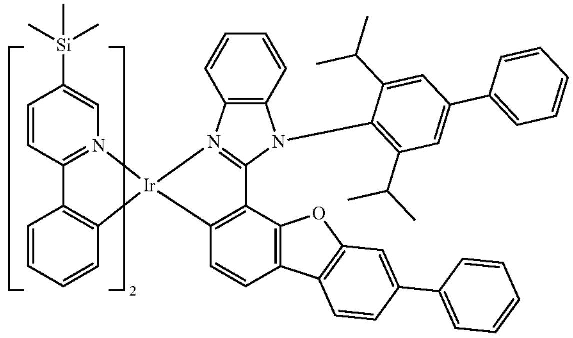
-continued
1387
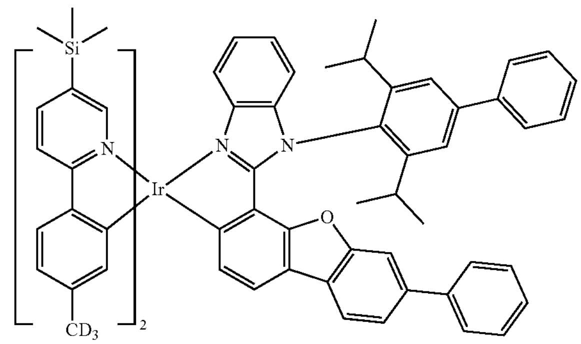
1388
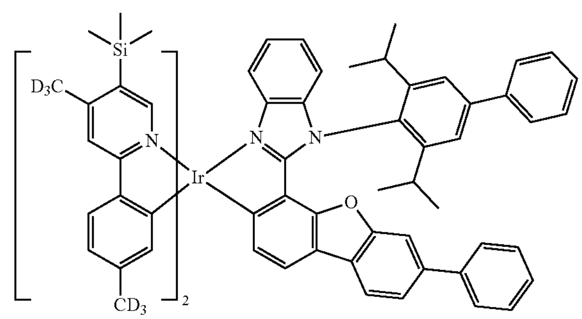
1389
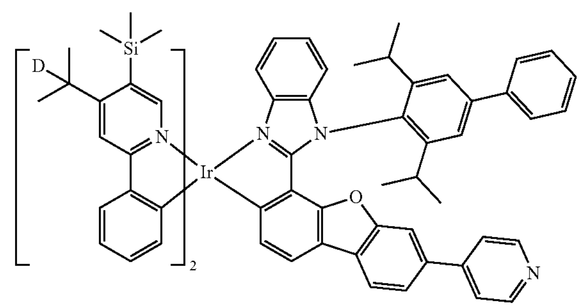
1390
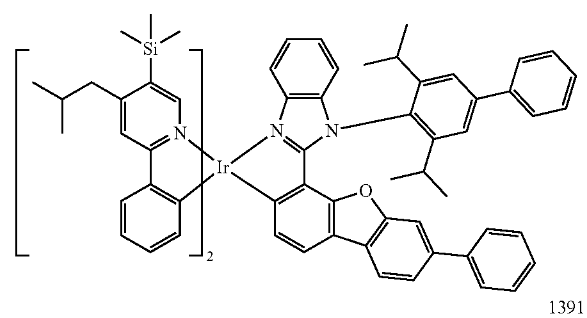
1391
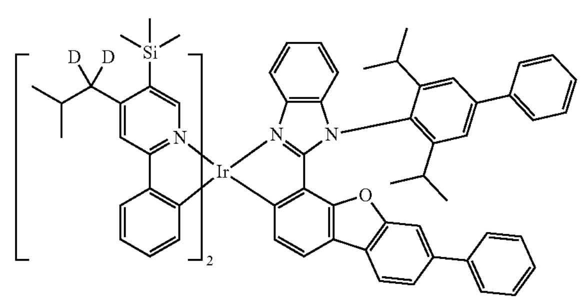

1392
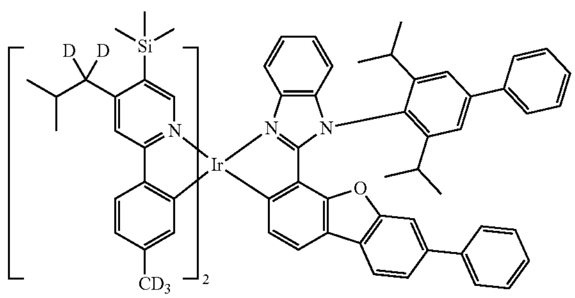
1393
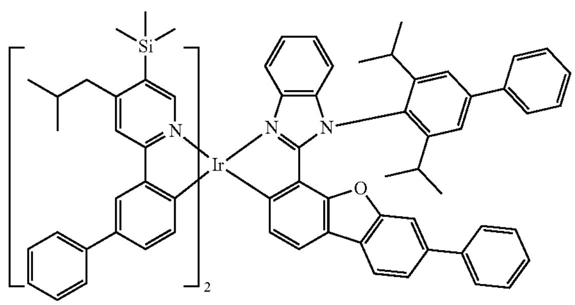
1394
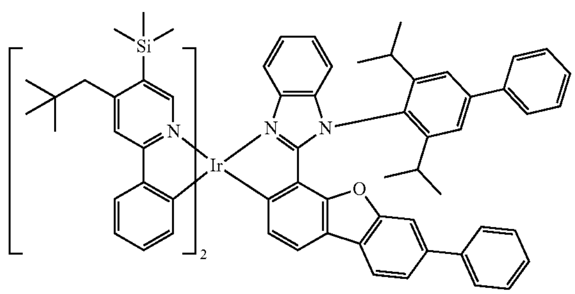
1395
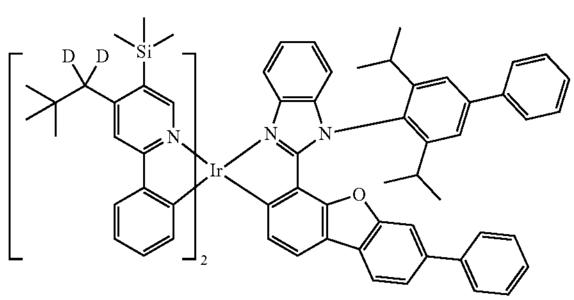
1396
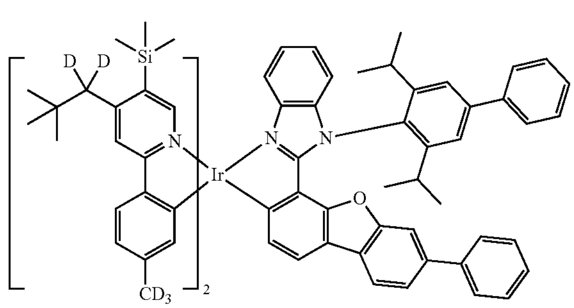
1397
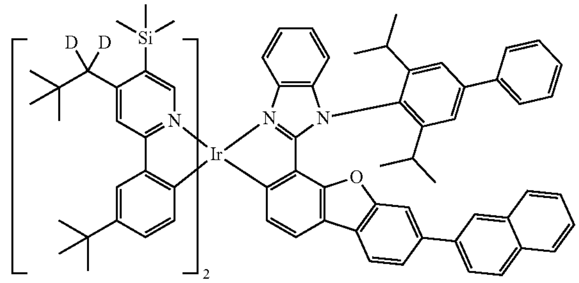
1398
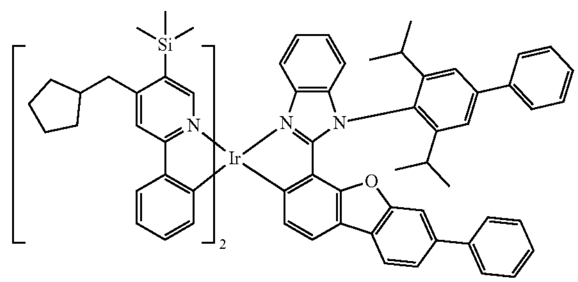
1399
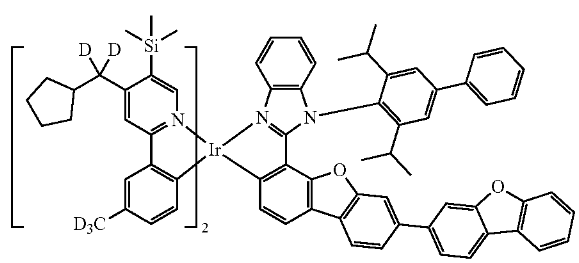
1400
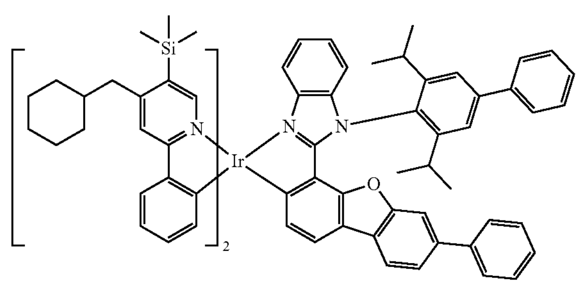
1401
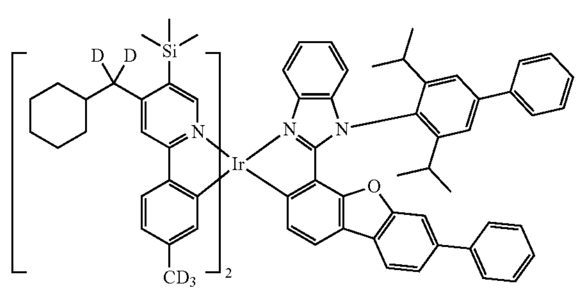

1402
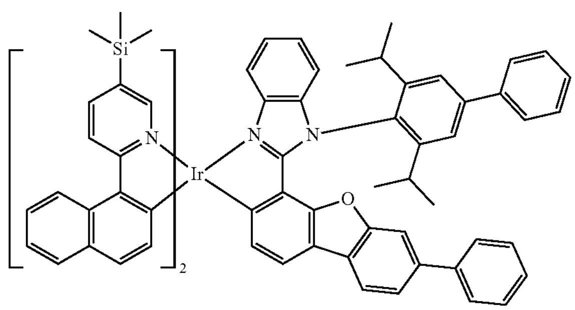
1403
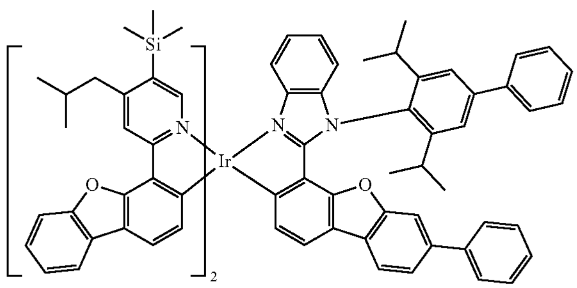
1404
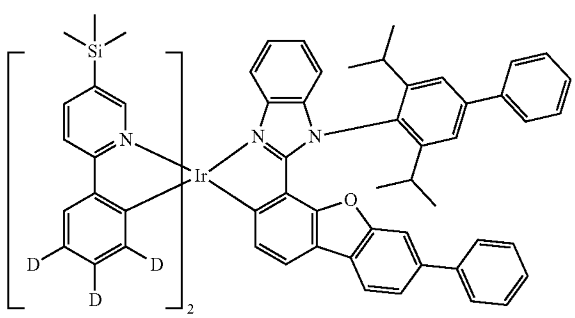
1405
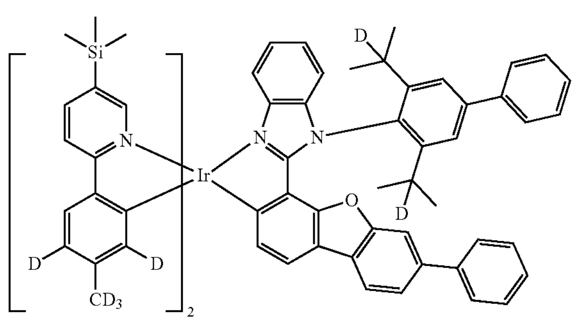
1406
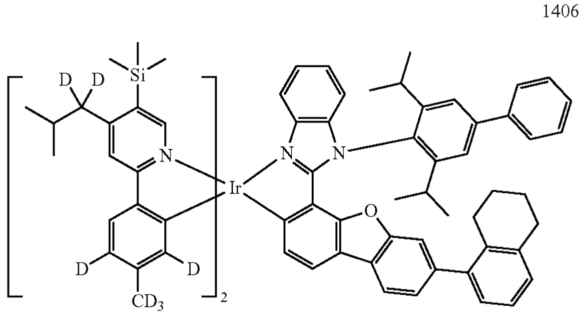
1407
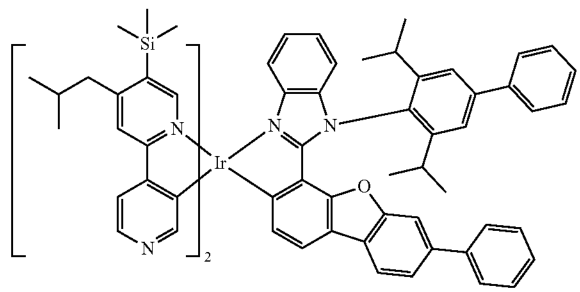
1408
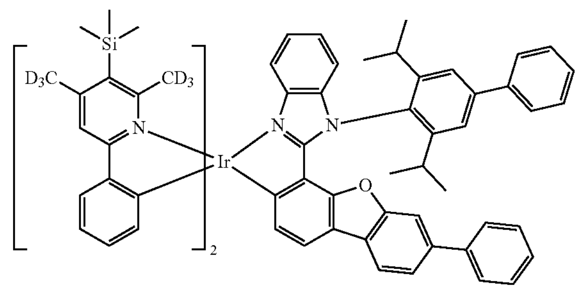
1409
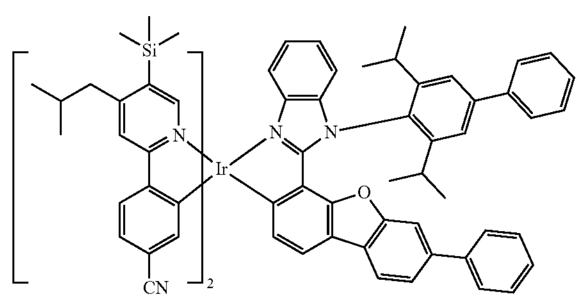
1410
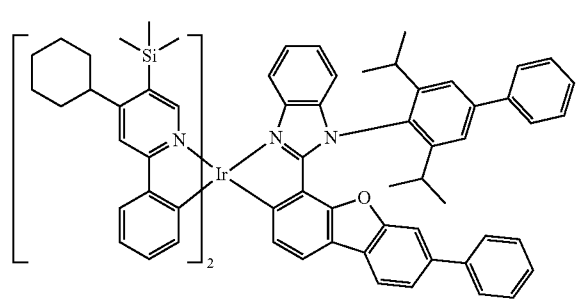

1411
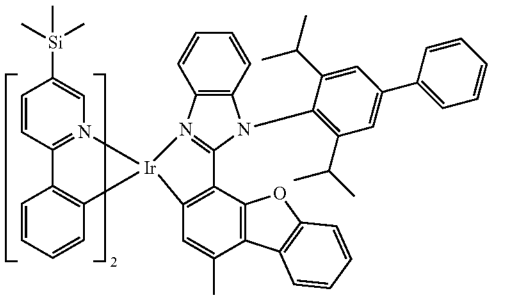
1412
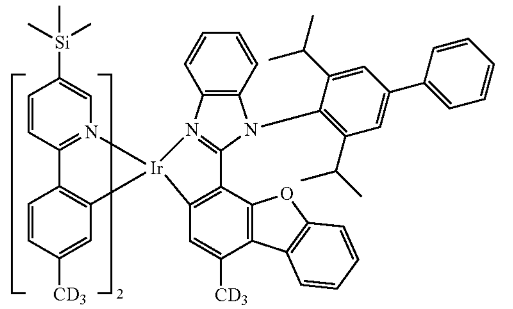
1413
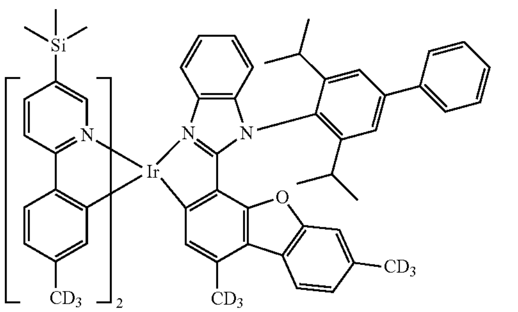
1414
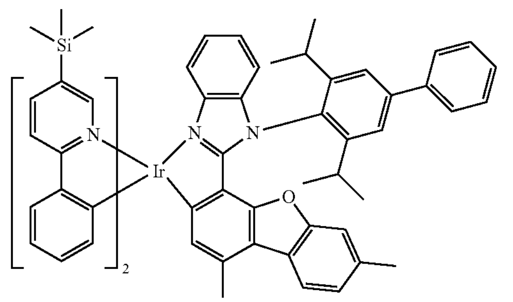
1415
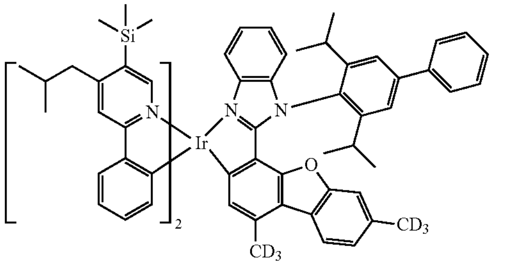
1416
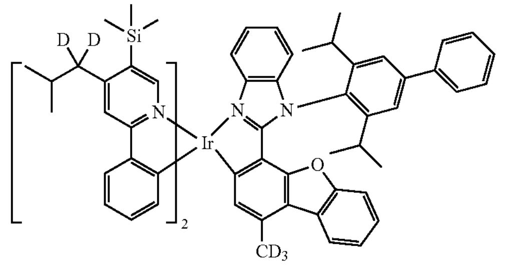
1417
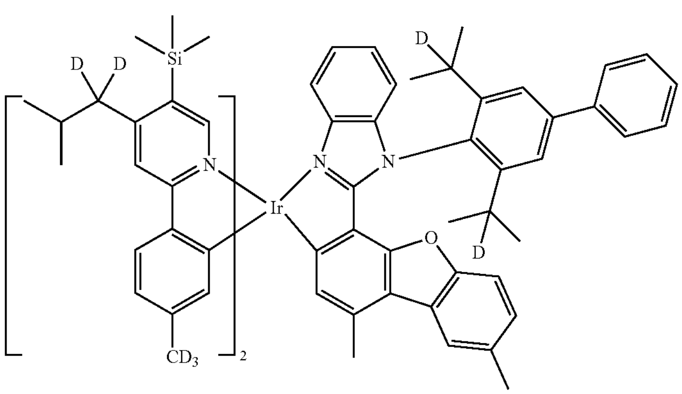

-continued
1418
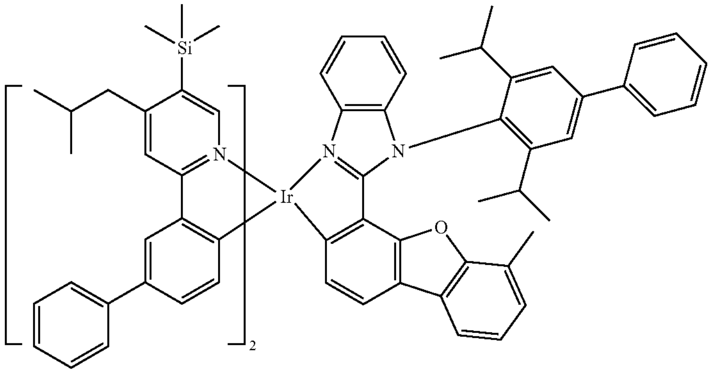
1419
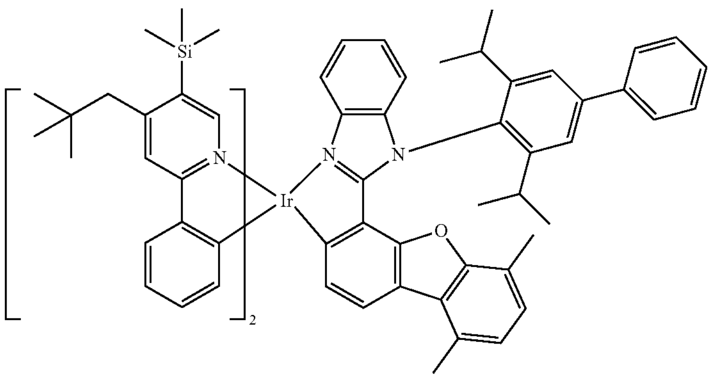
1420
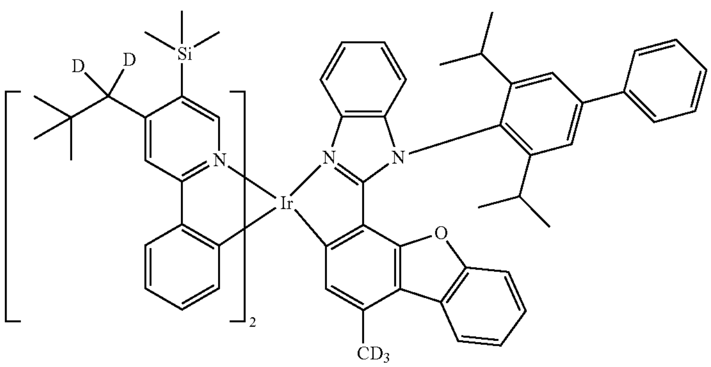
1421
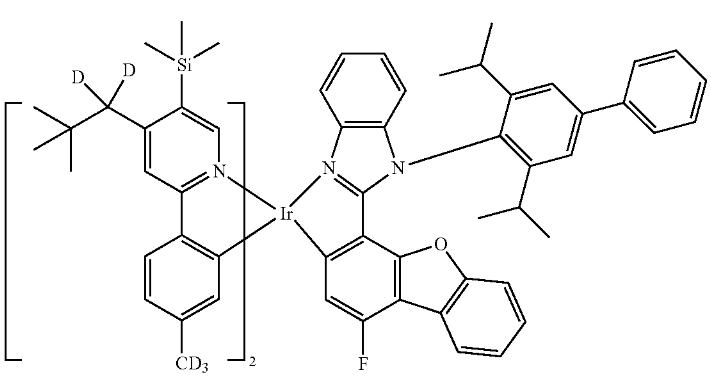

-continued
1422
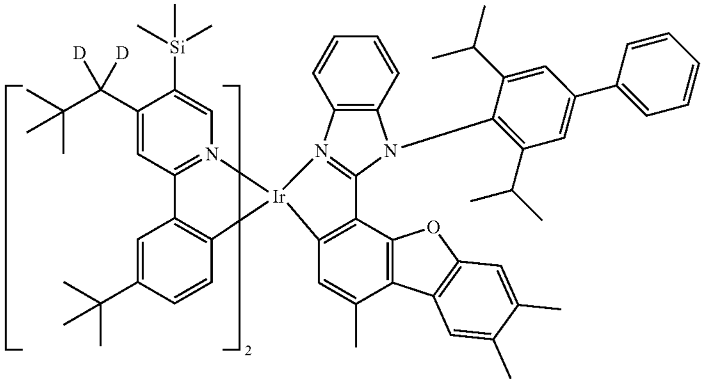
1423
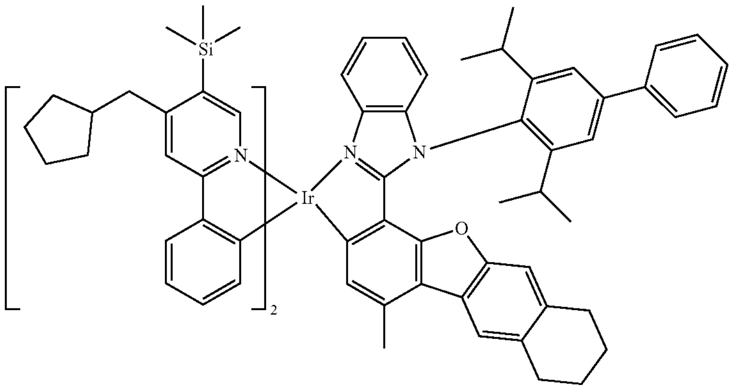
1424
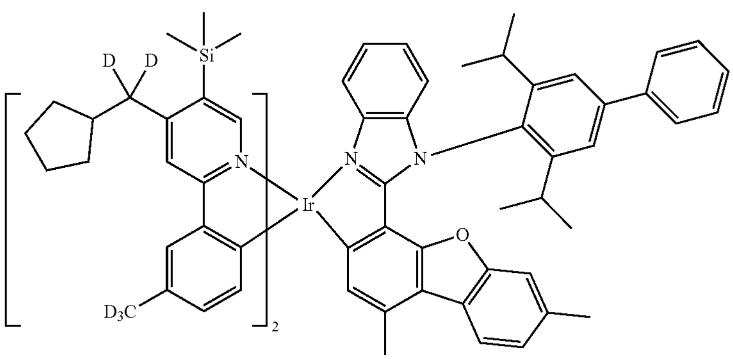
1425
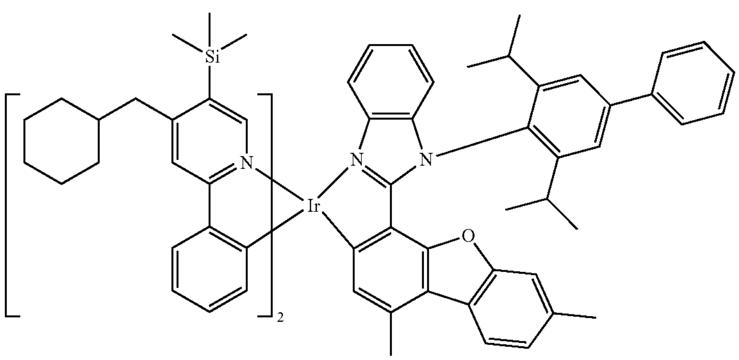

-continued
1426
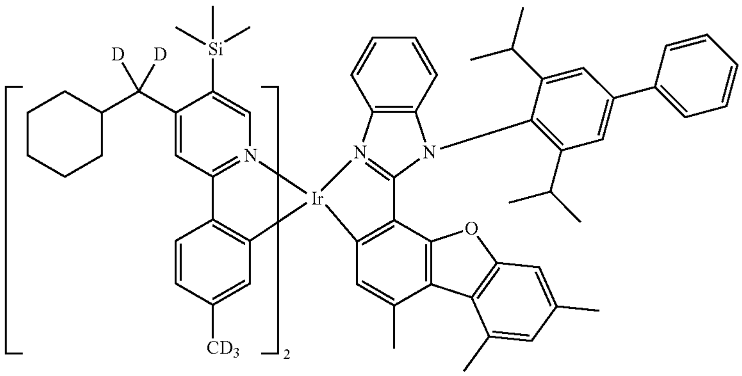
1427
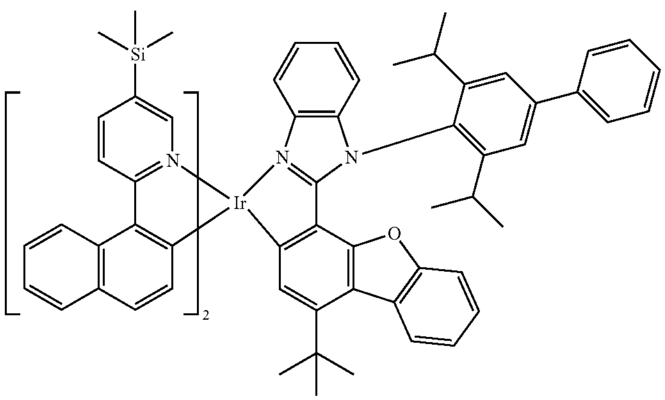
1428
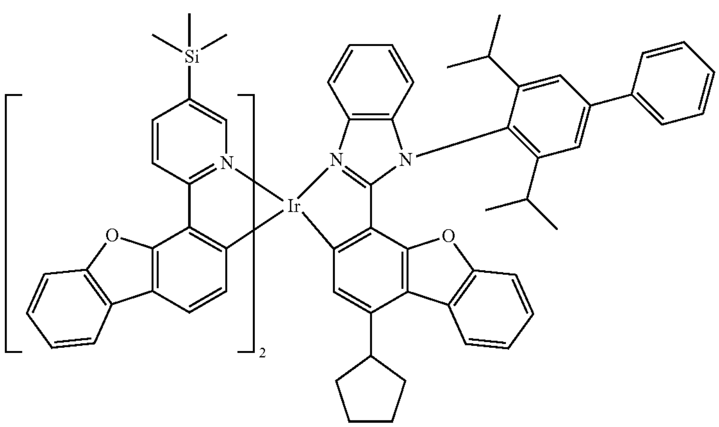
1429
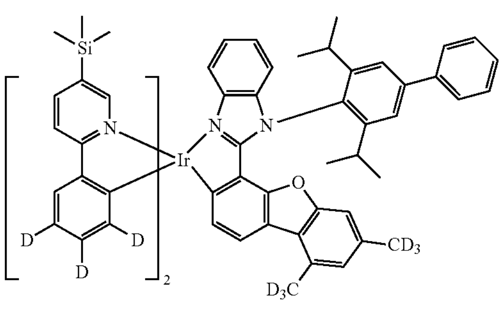
1430
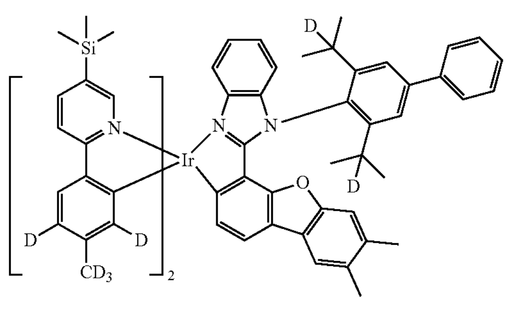

-continued
1431
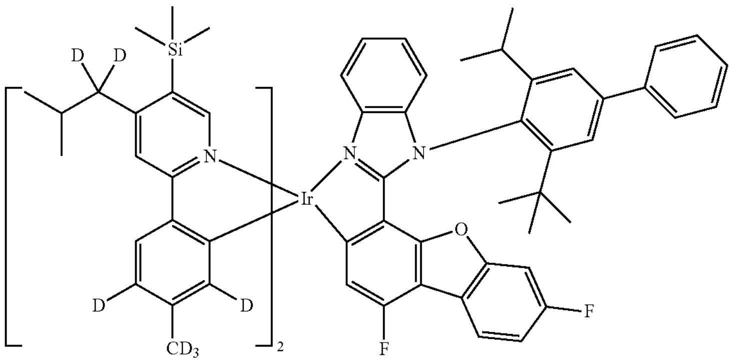
1432
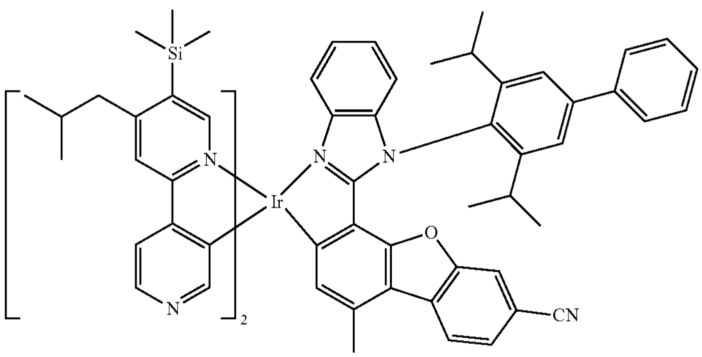
1433
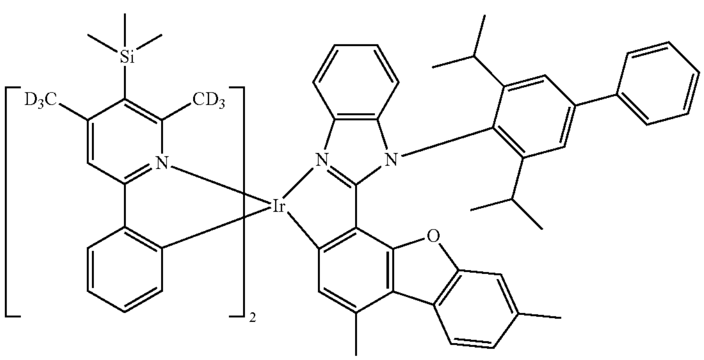
1434
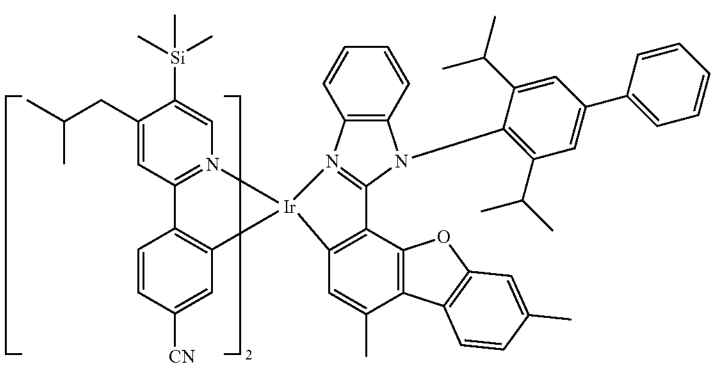

-continued
1435
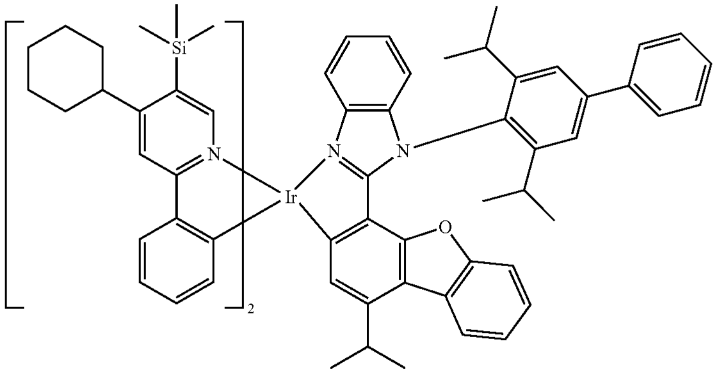
1436
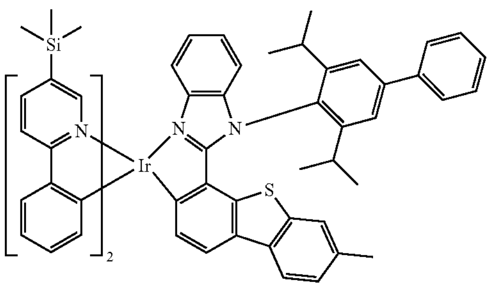
1437
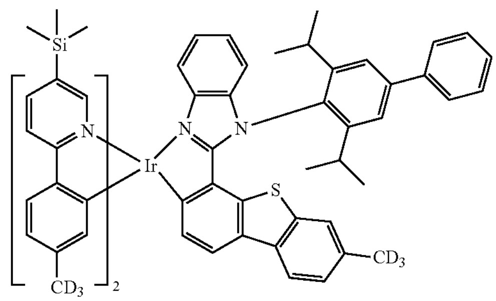
1438
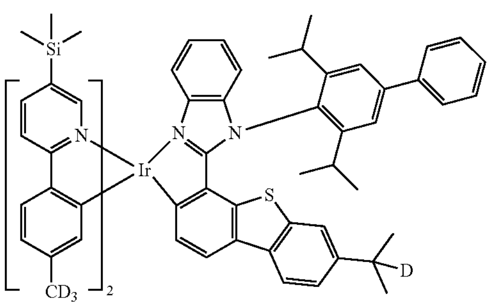
1439
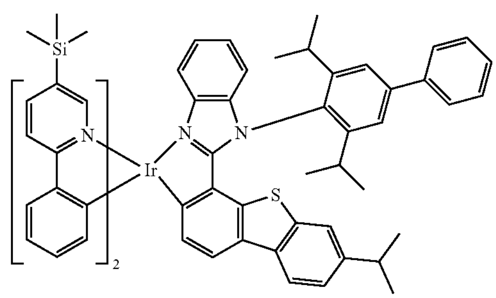
1440
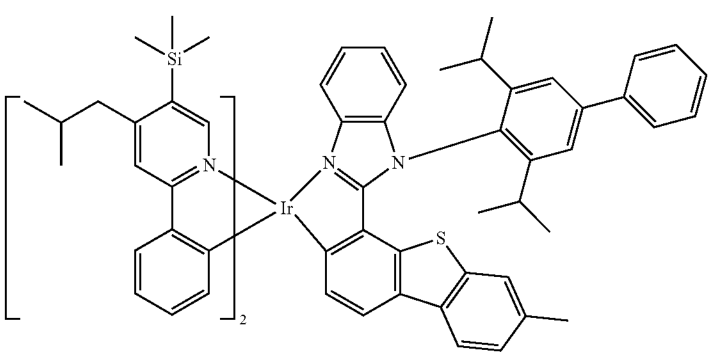

-continued
1441
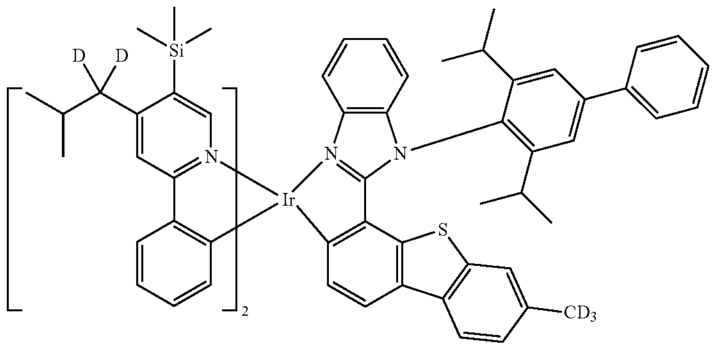
1442
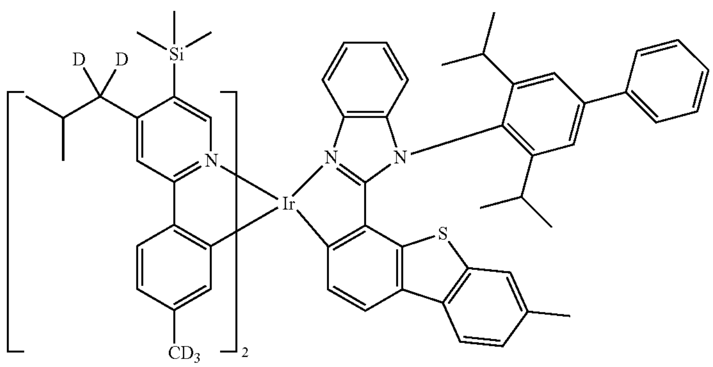
1443
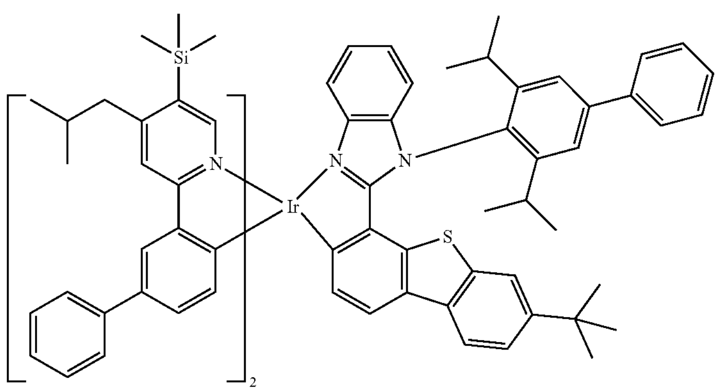
1444
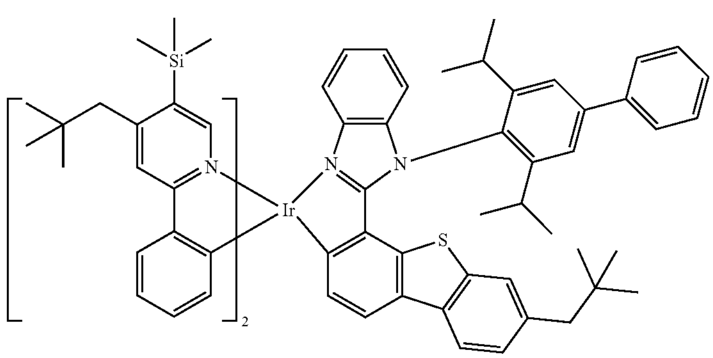

-continued
1445
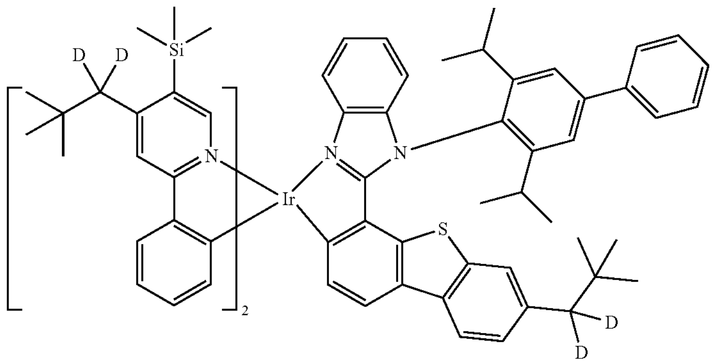
1446
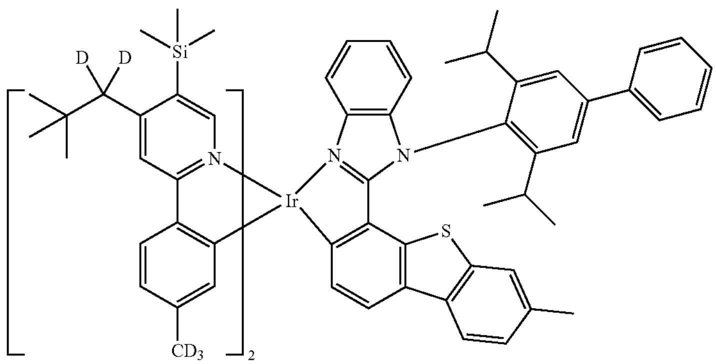
1147
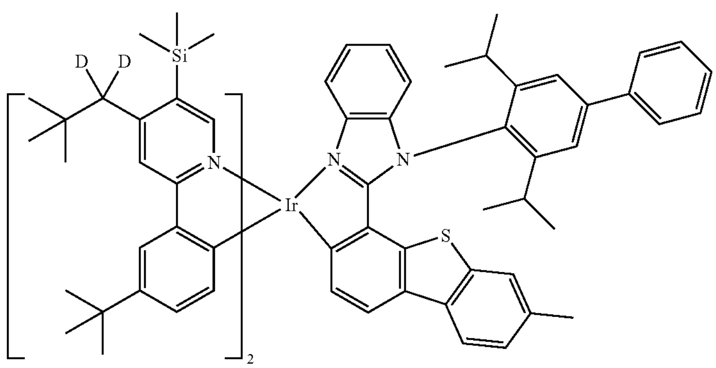
1448
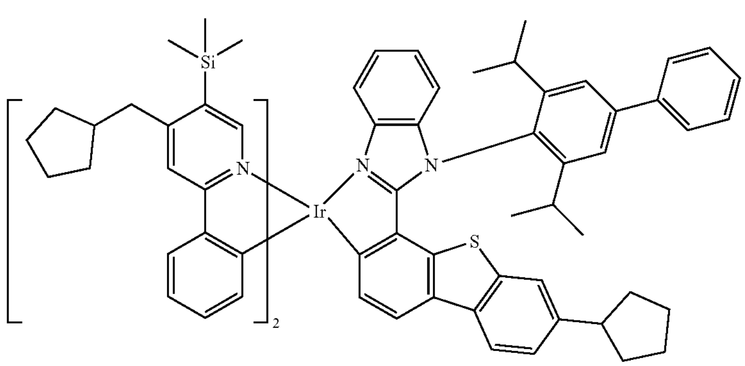

-continued
1449
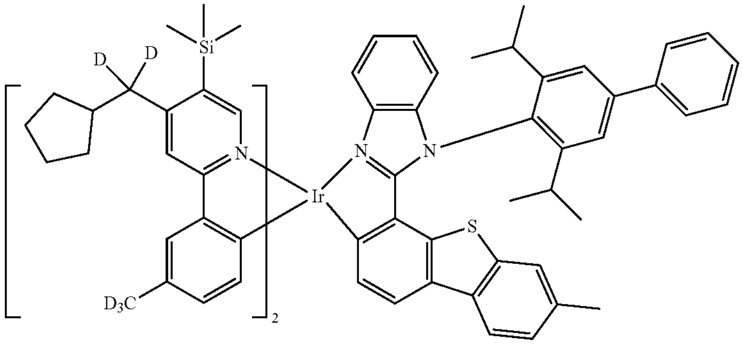
1450
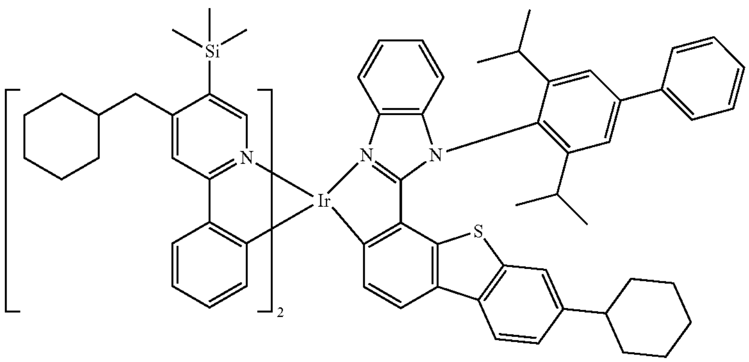
1451
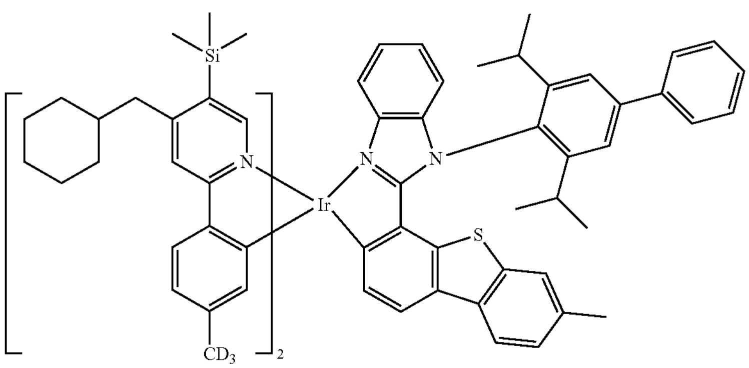
1452
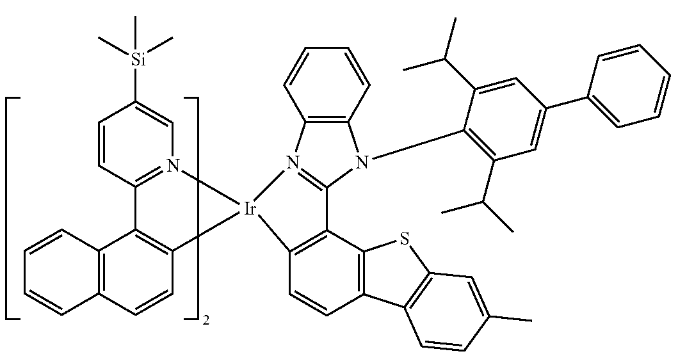

-continued
1453
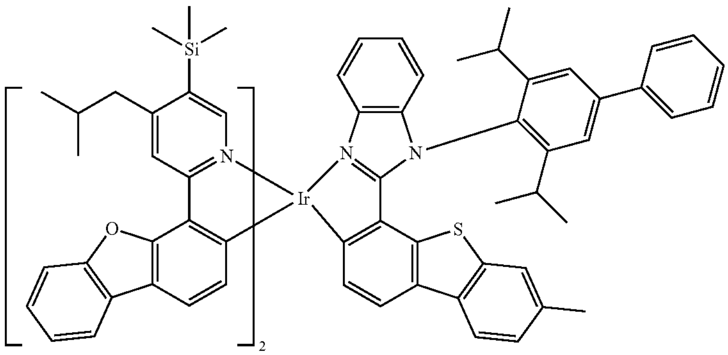
1454
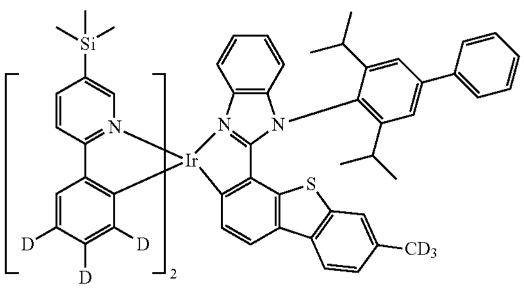
1455
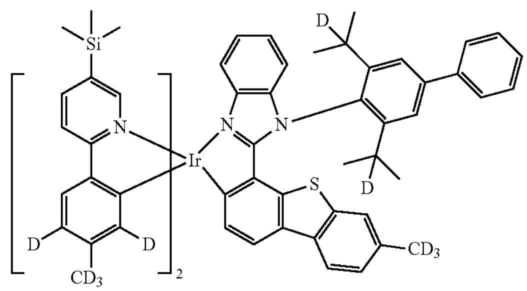
1456
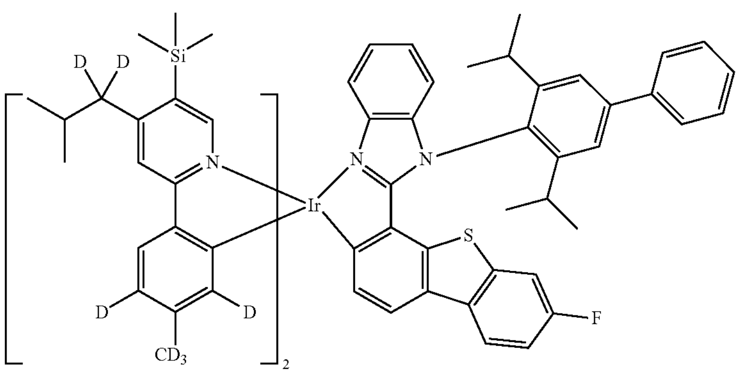
1457
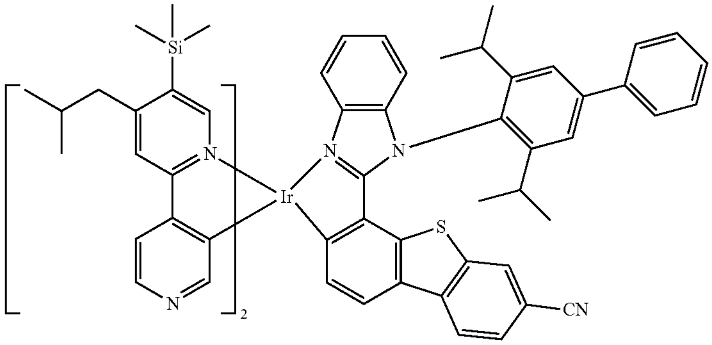

-continued
1458
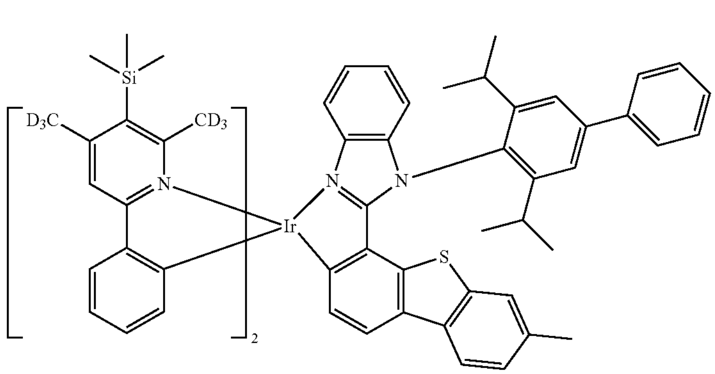
1459
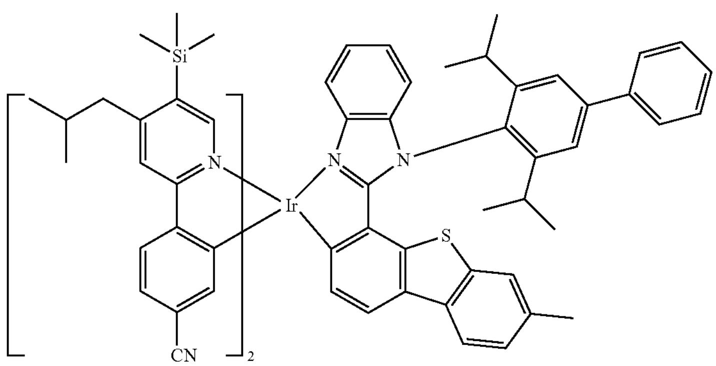
1460
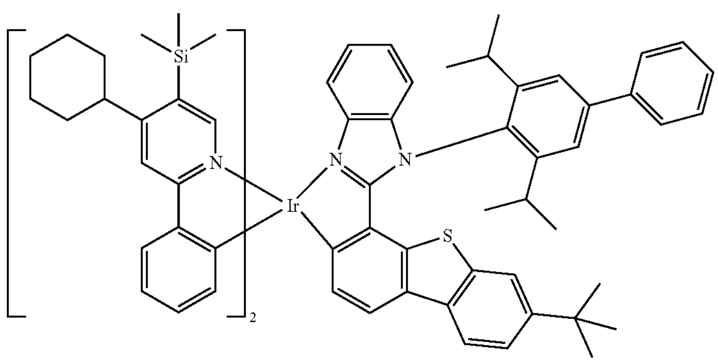
1461
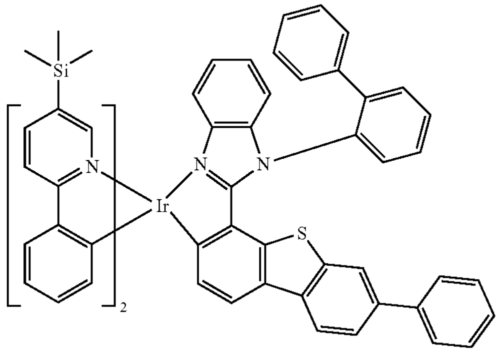
1462
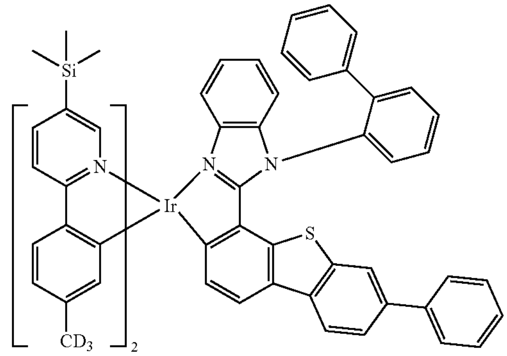

-continued
1463
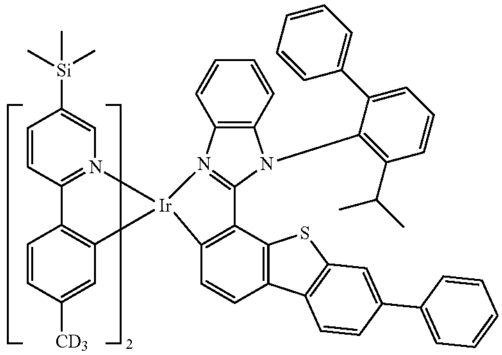
1464
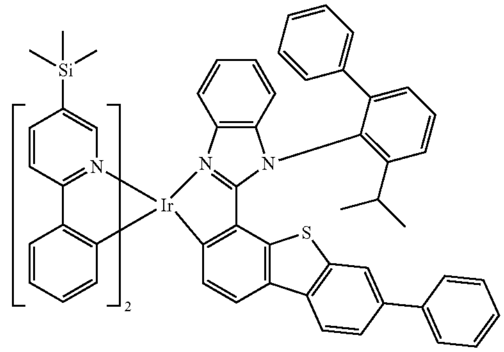
1465
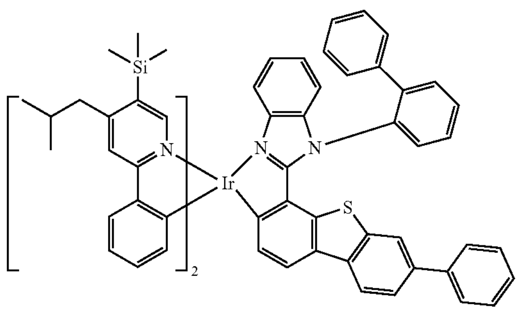
1466
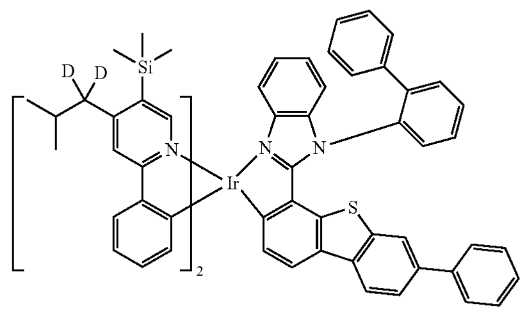
1467
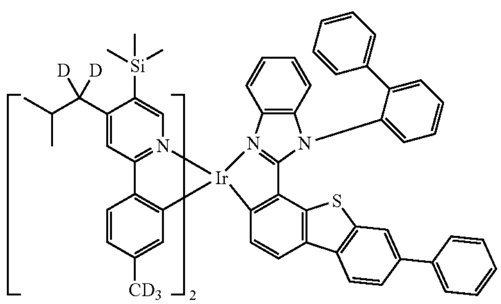
1468
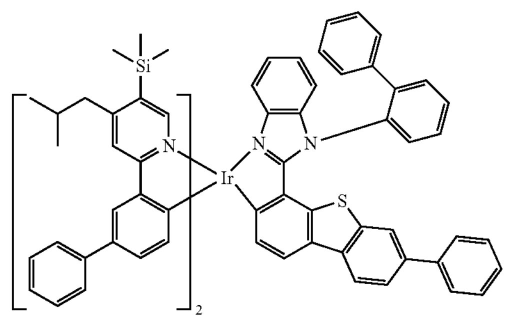
1469
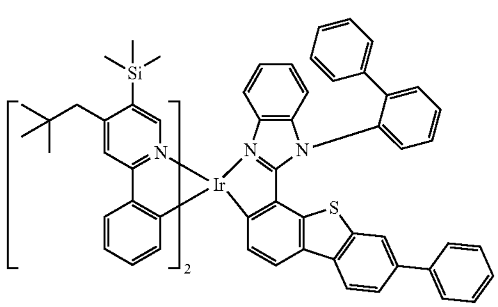
1470
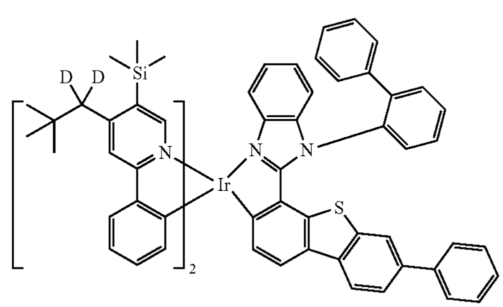

-continued
1471
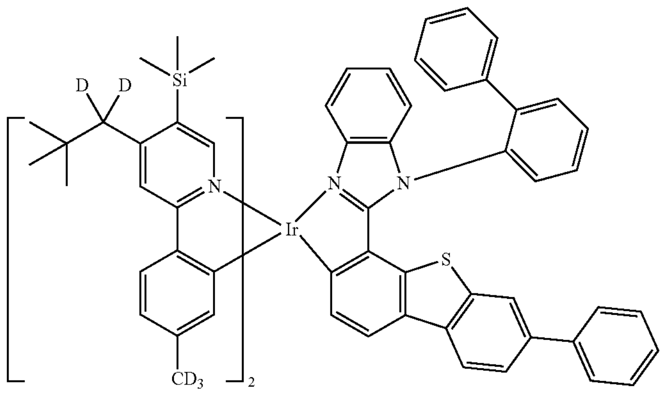
1472
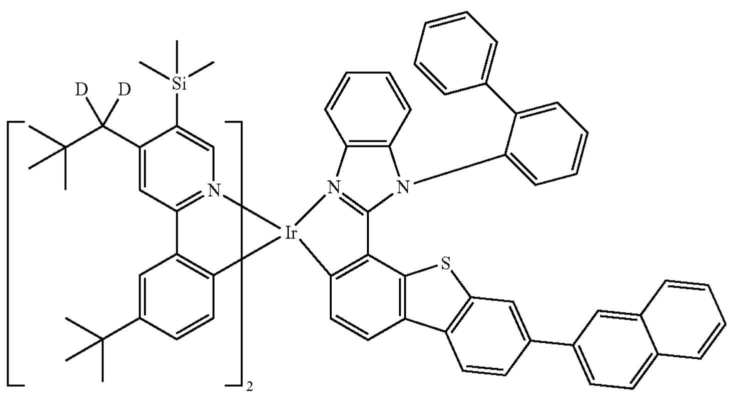
1473
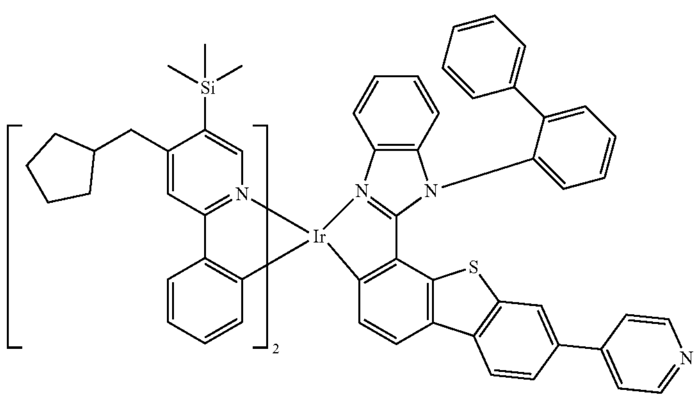
1474
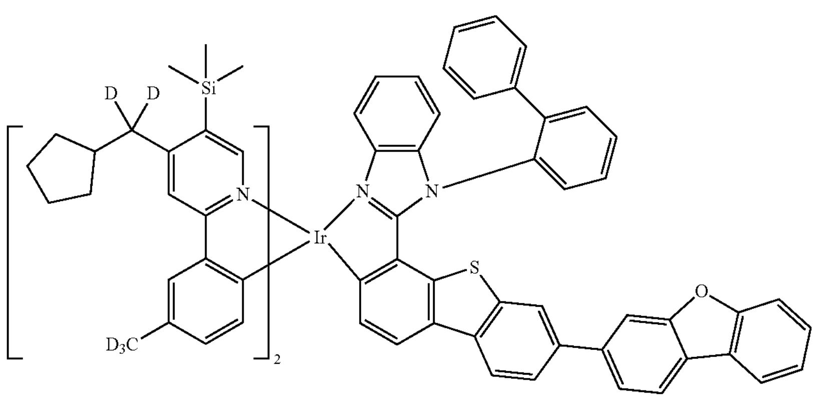

-continued
1475
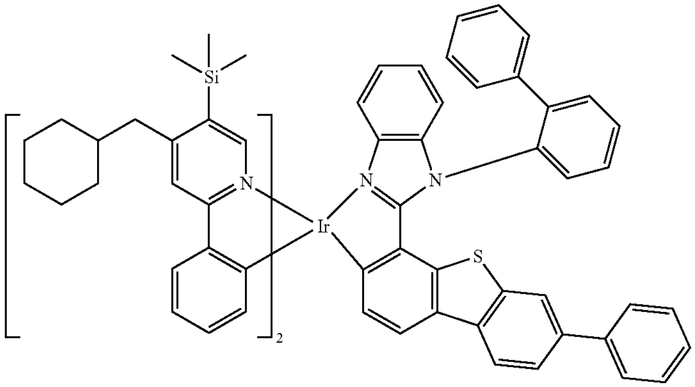
1476
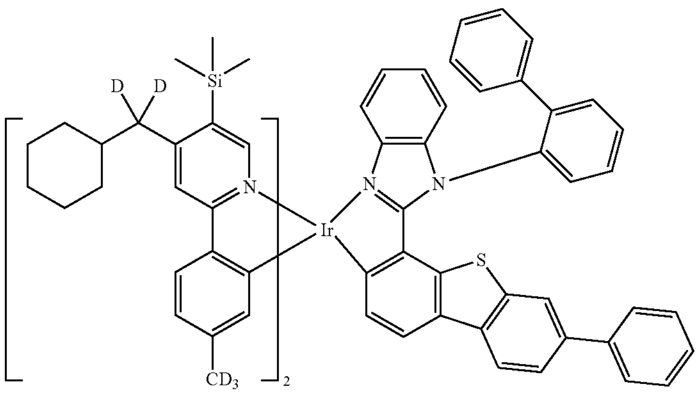
1477
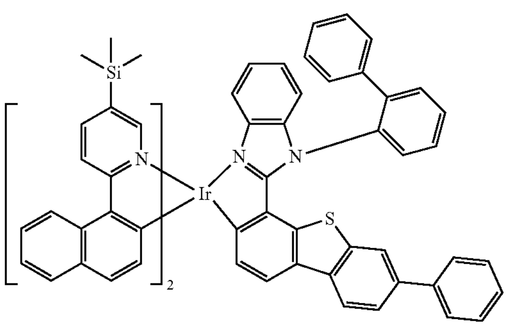
1478
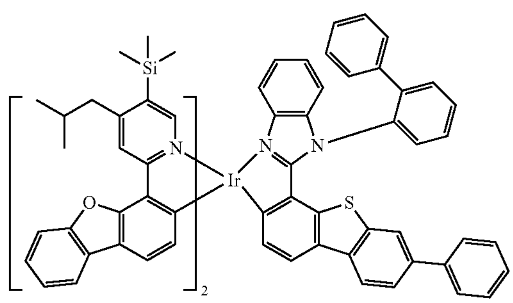
1479
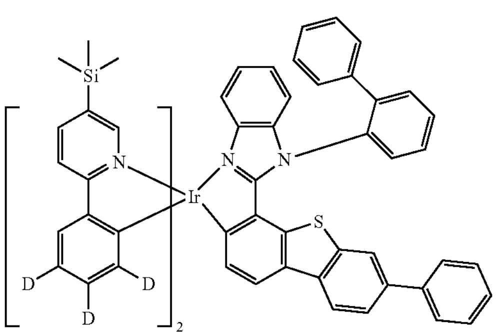
1480
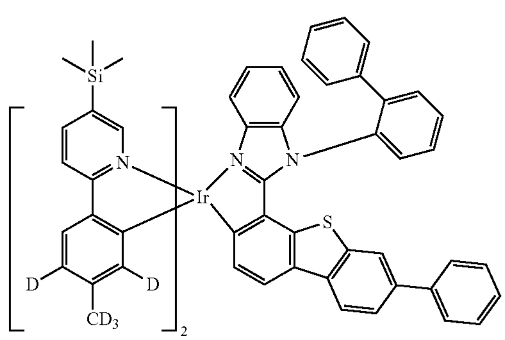

-continued
1481
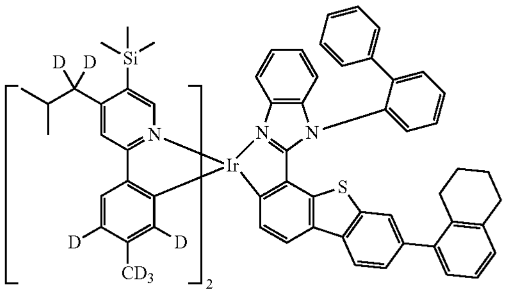
1482
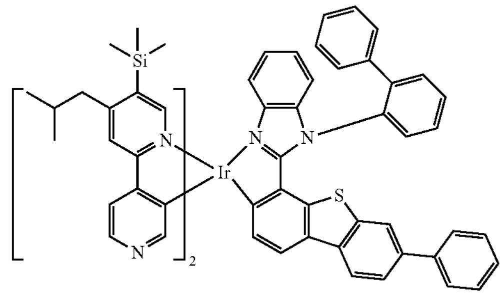
1483
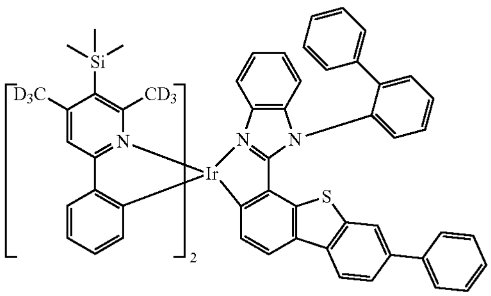
1484
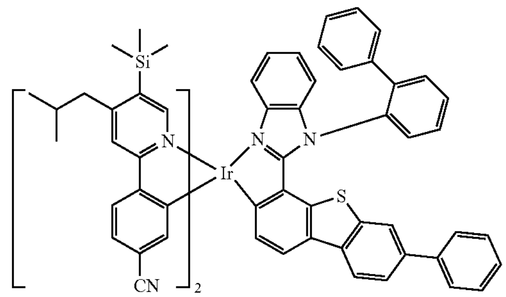
1485
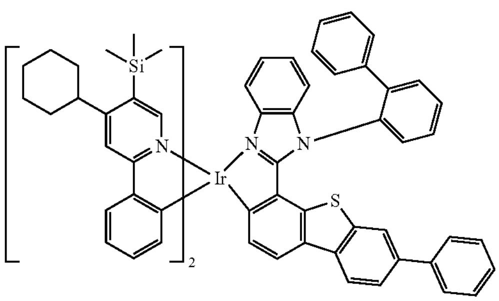
1486
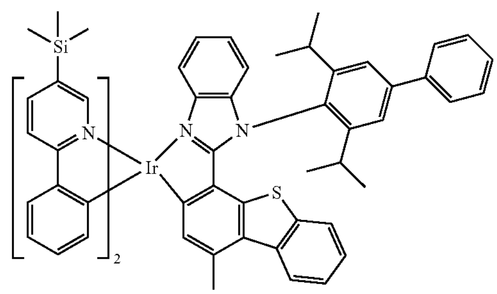
1487
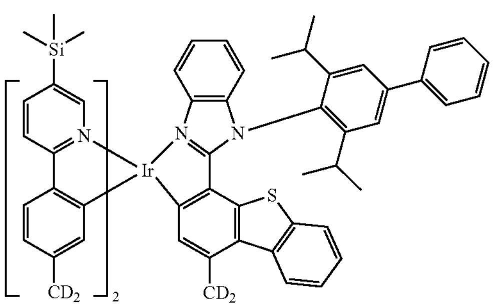
1488
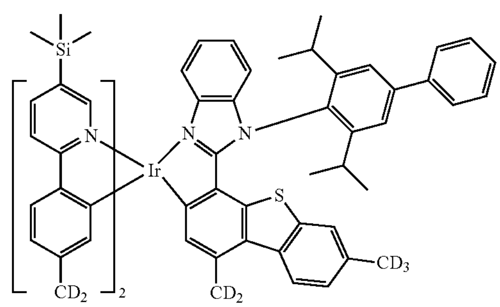
1489
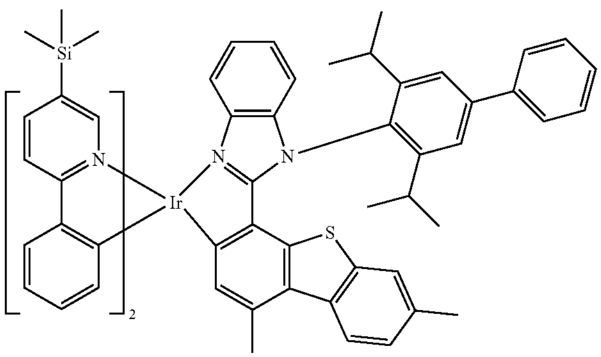

-continued
1490
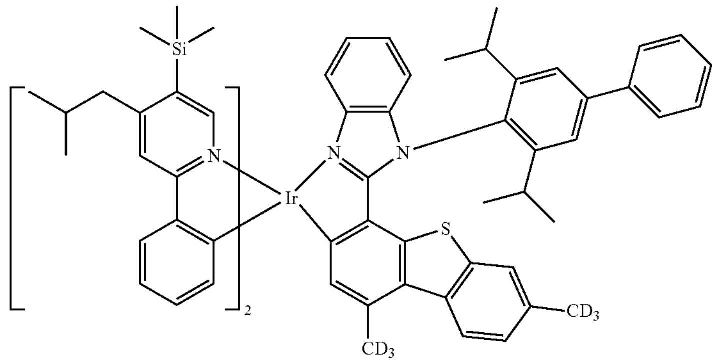
1491
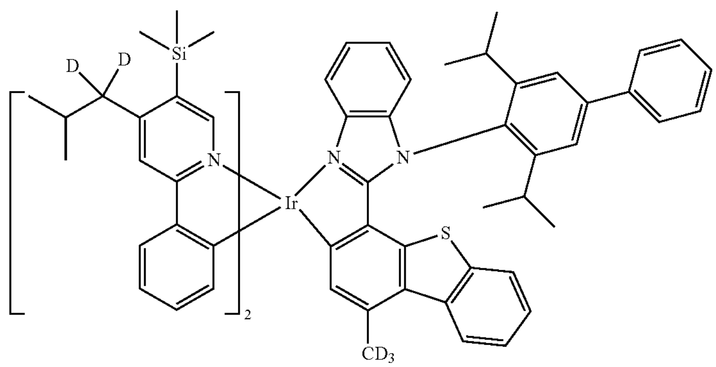
1492
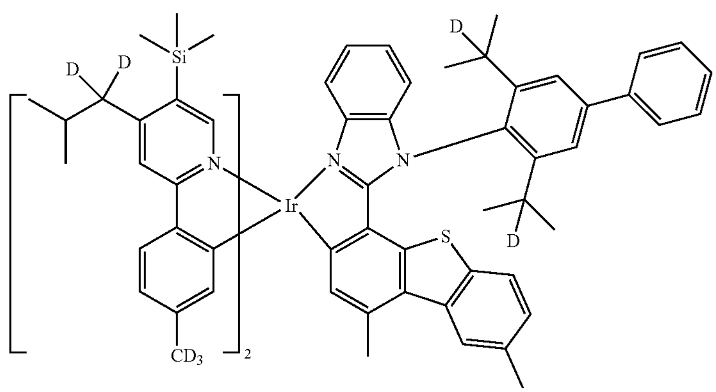
1493
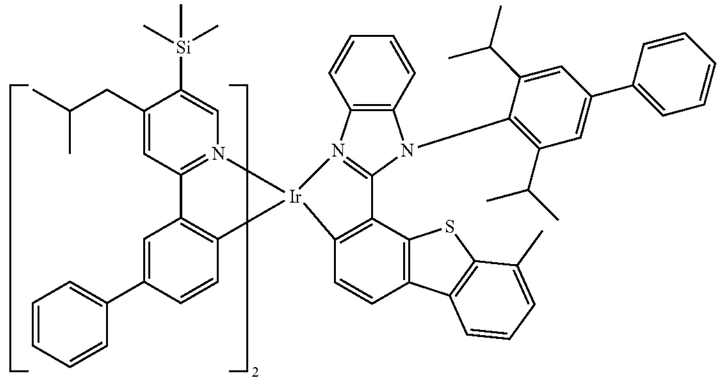

-continued
1494
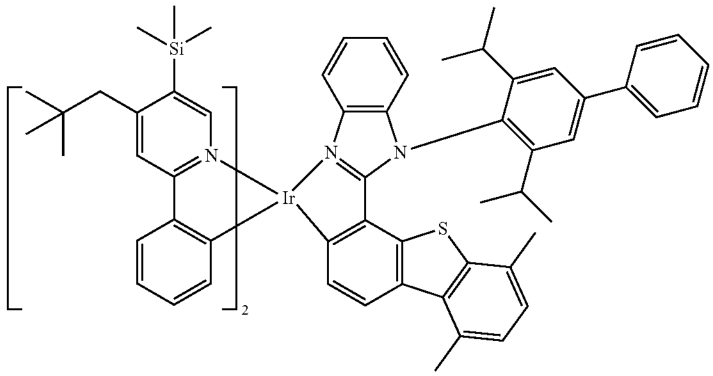
1495
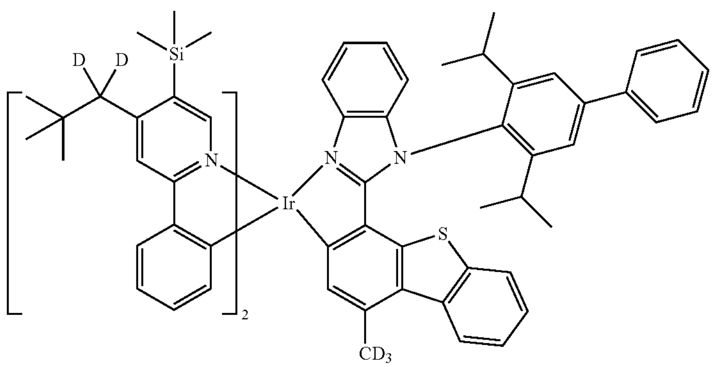
1496
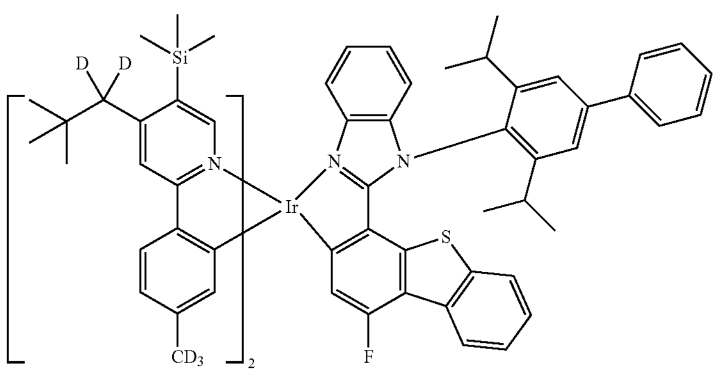
1497
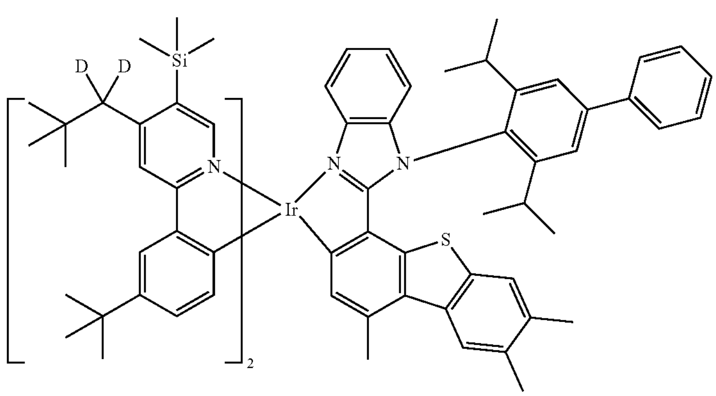

-continued
1498
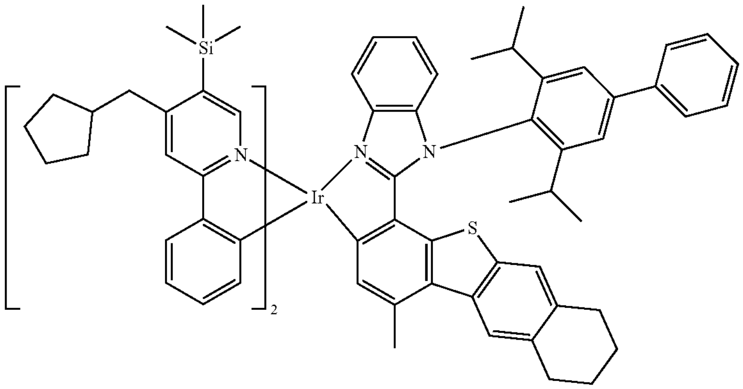
1499
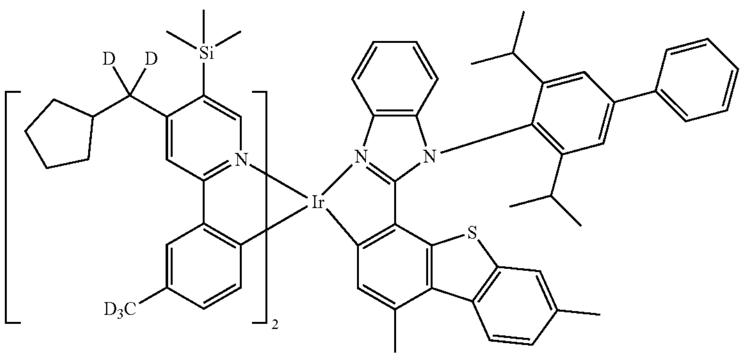
1500
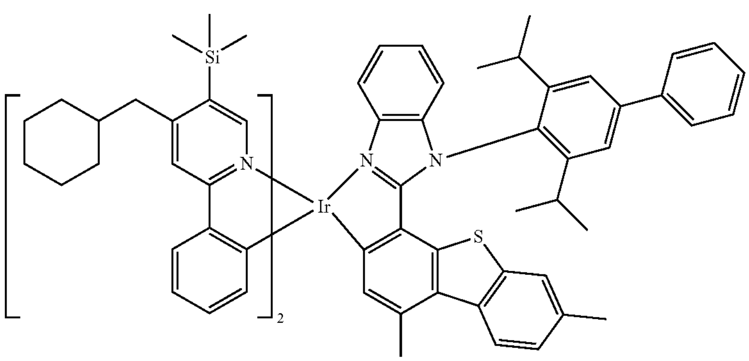
1501
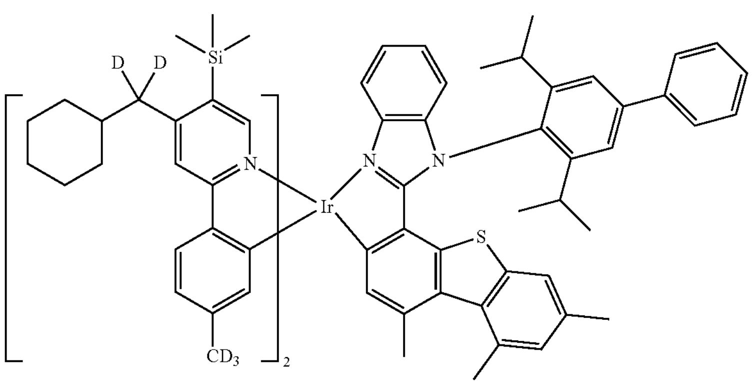

-continued
1502
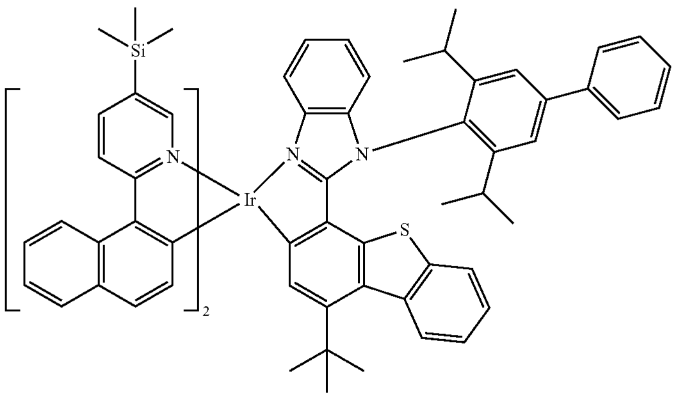
1503
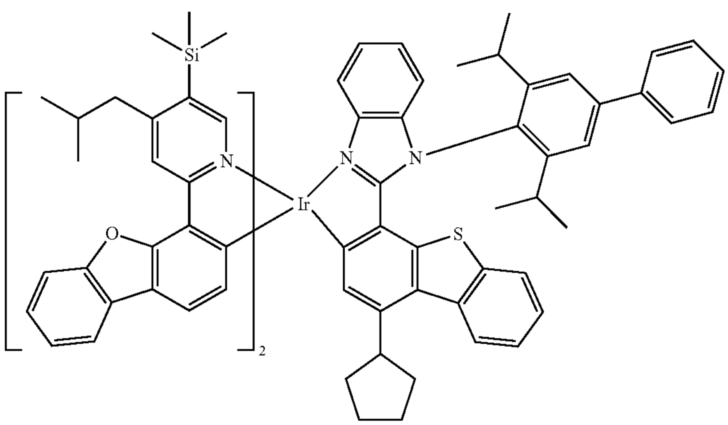
1504
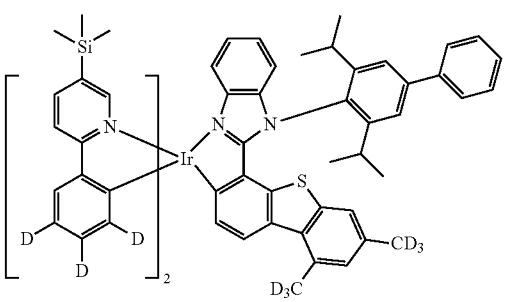
1505
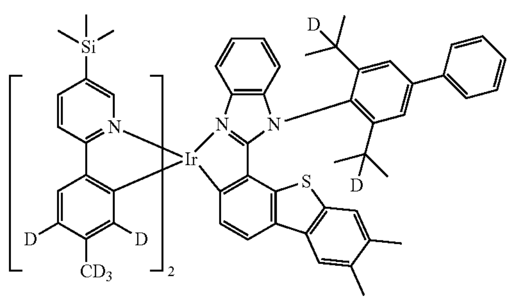
1506
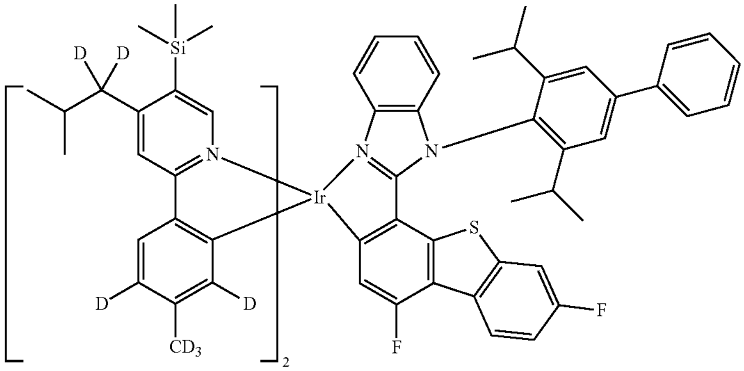

-continued
1507
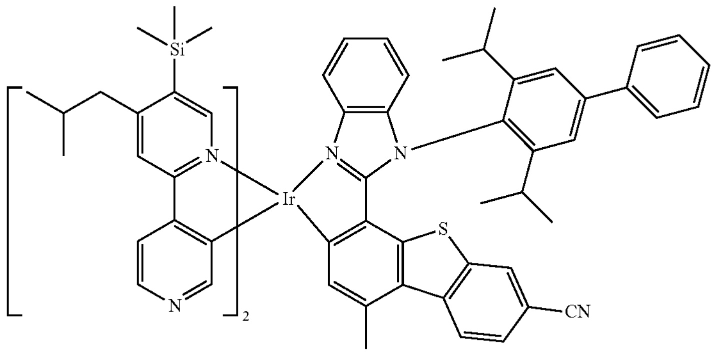
1508
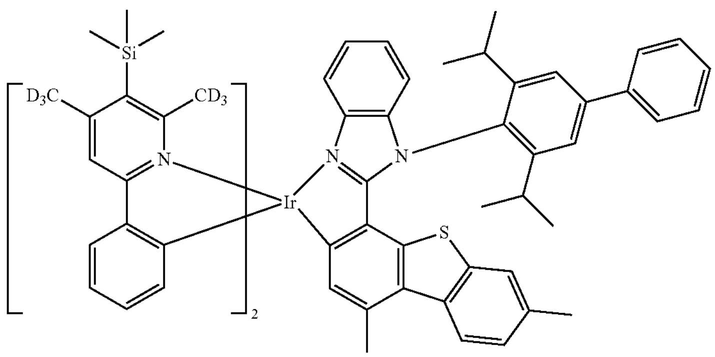
1509
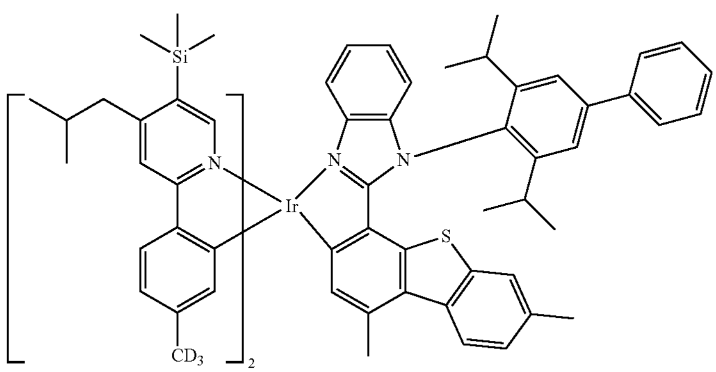
1510
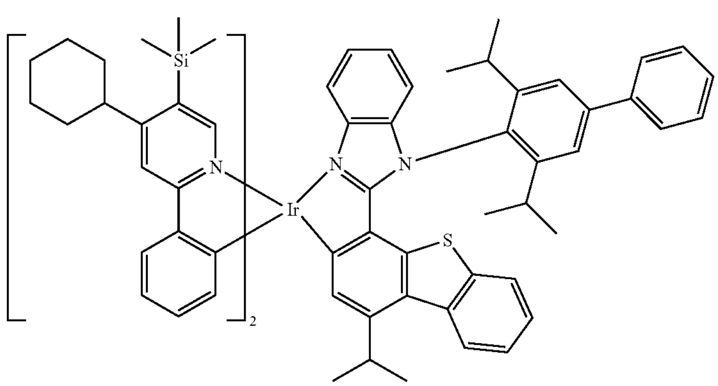

-continued
1511
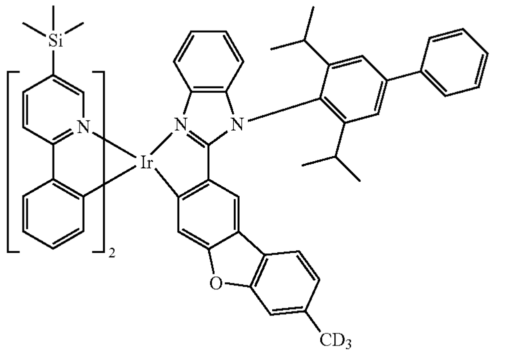
1512
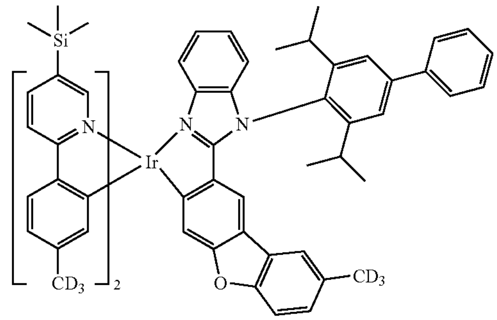
1513
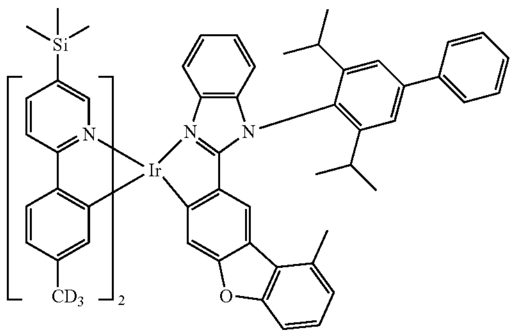
1514
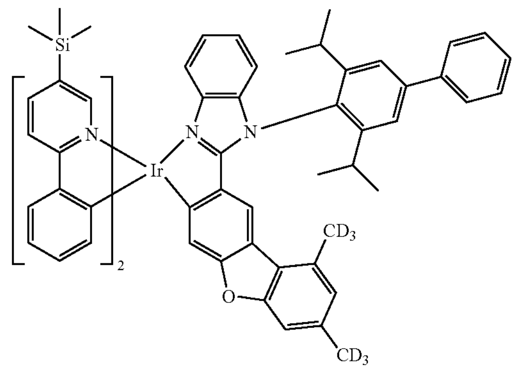
1515
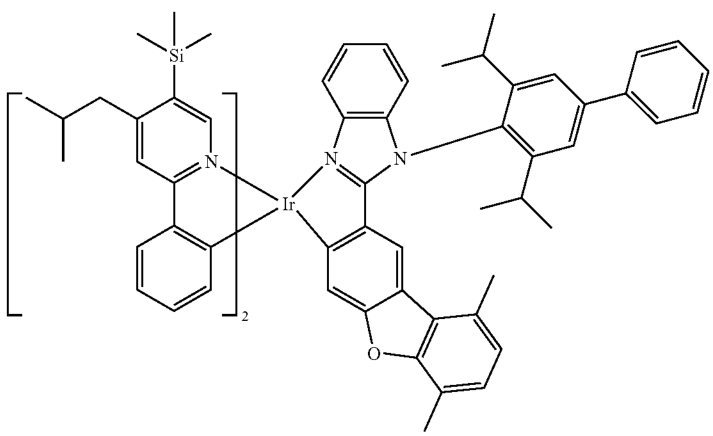
1516
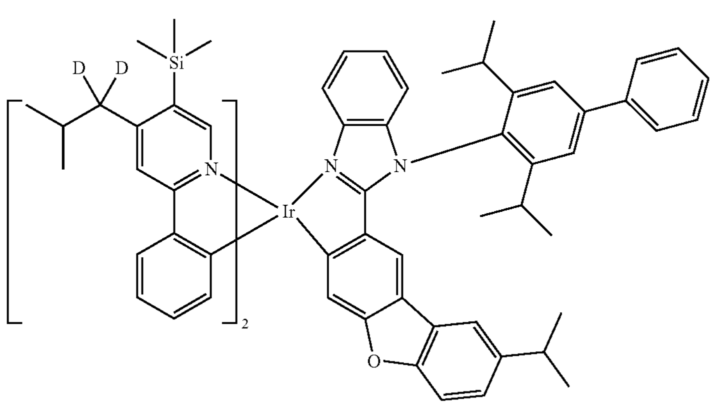

-continued
1517
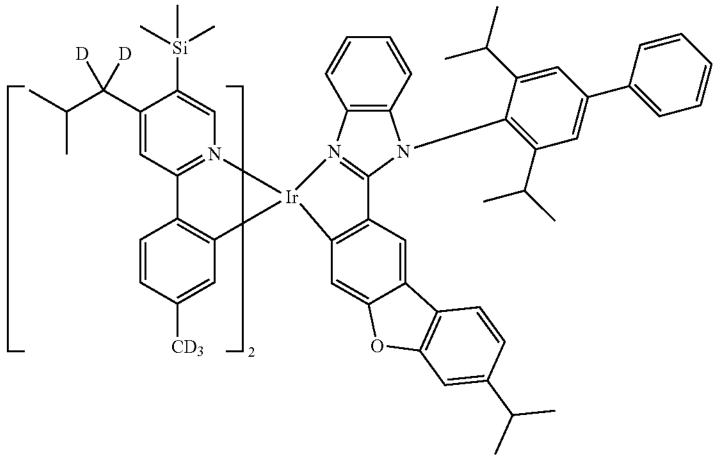
1518
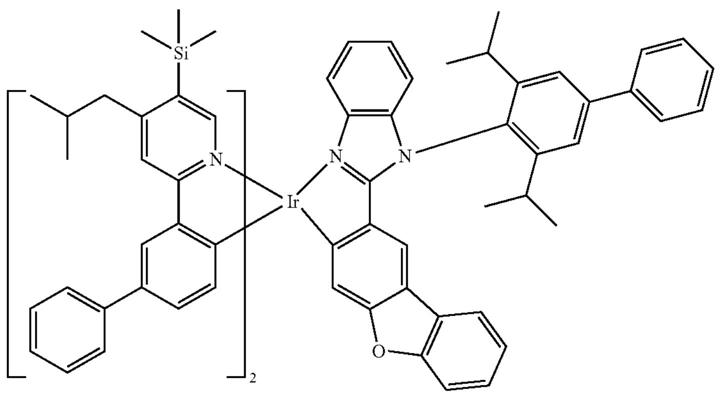
1519
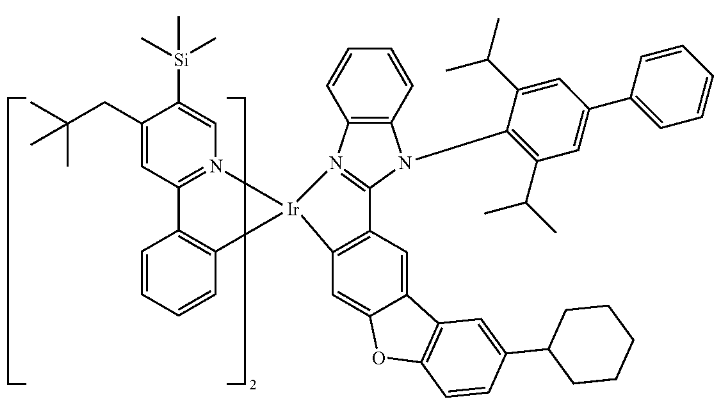

-continued
1520
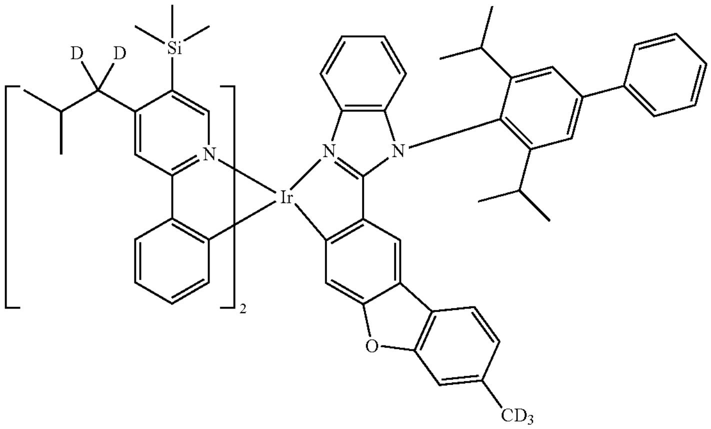
1521
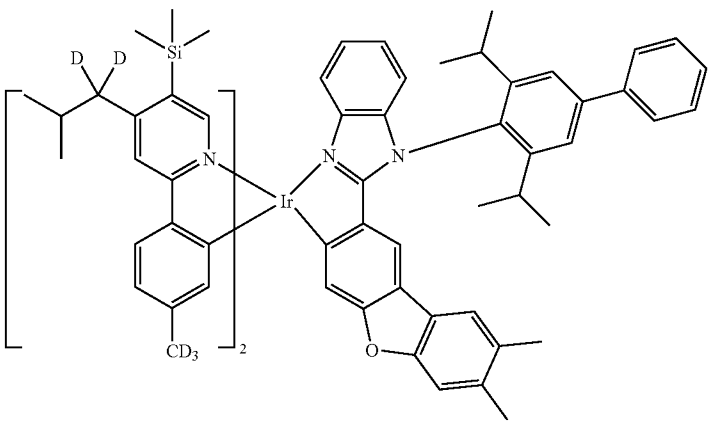
1522
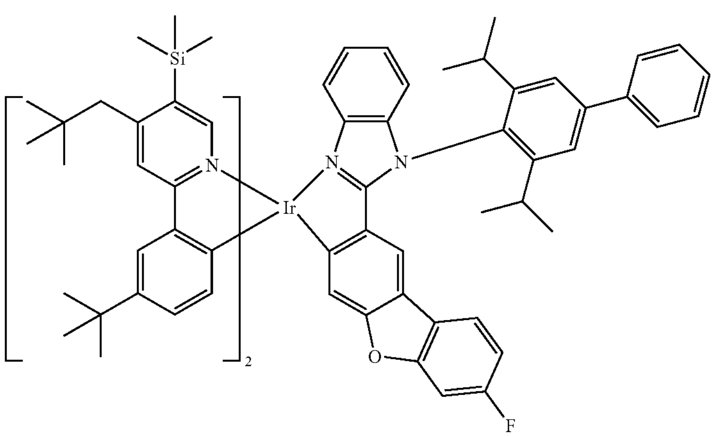

-continued
1523
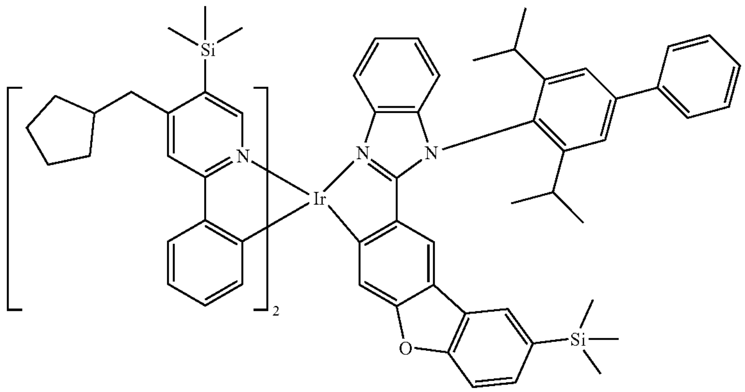
1524
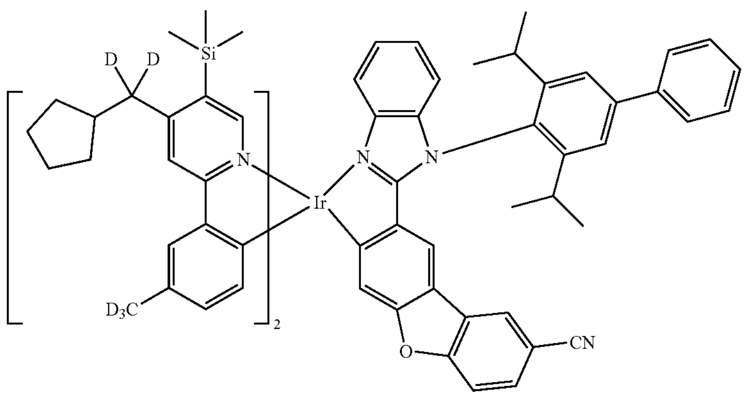
1525
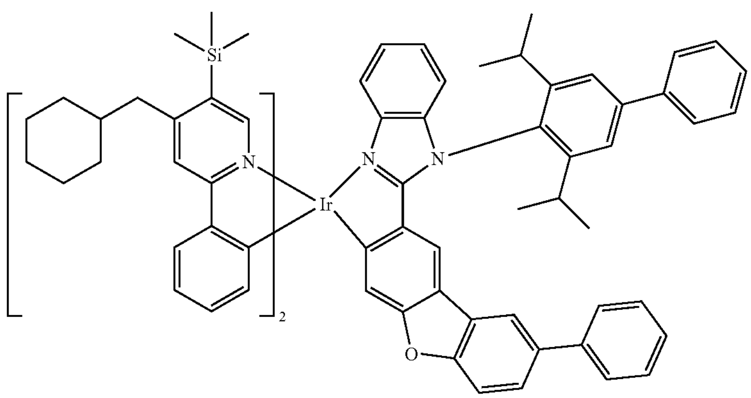
1526
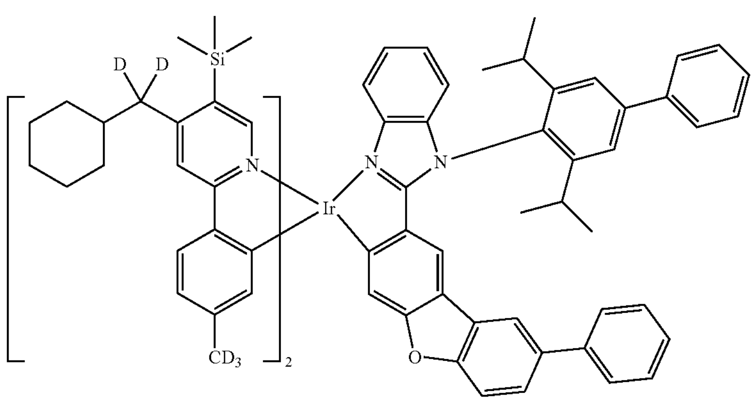

-continued
1527
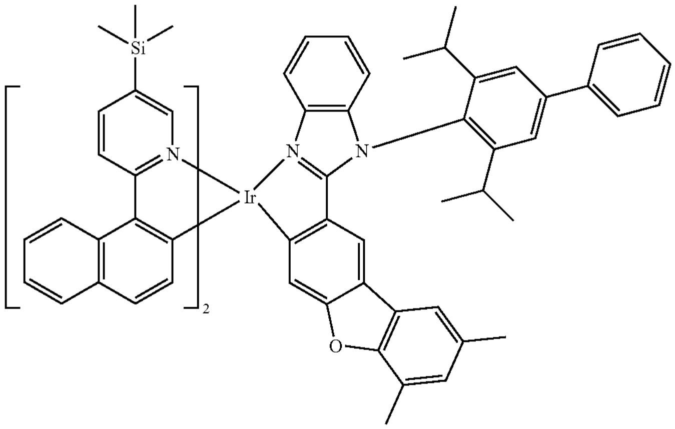
1528
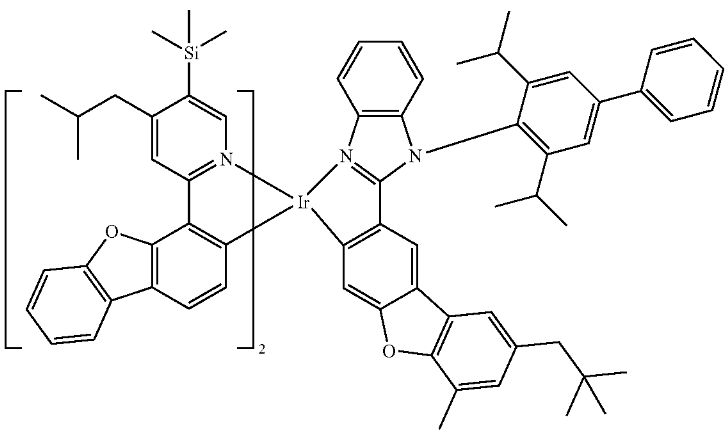
1529
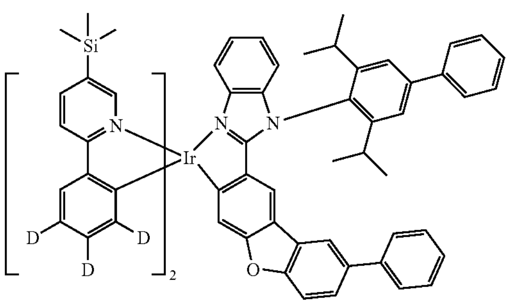
1530
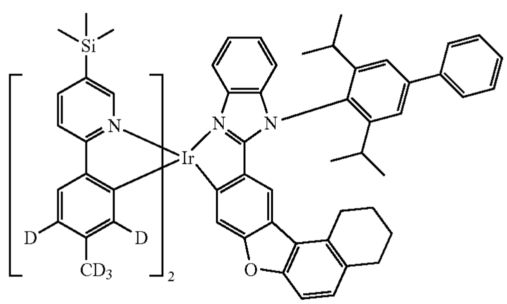
1531
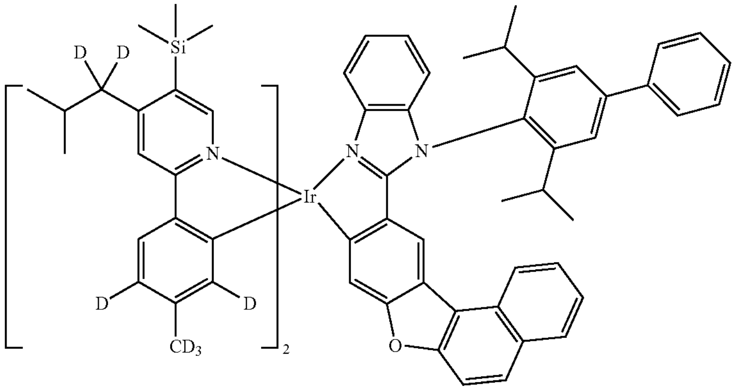

-continued
1532
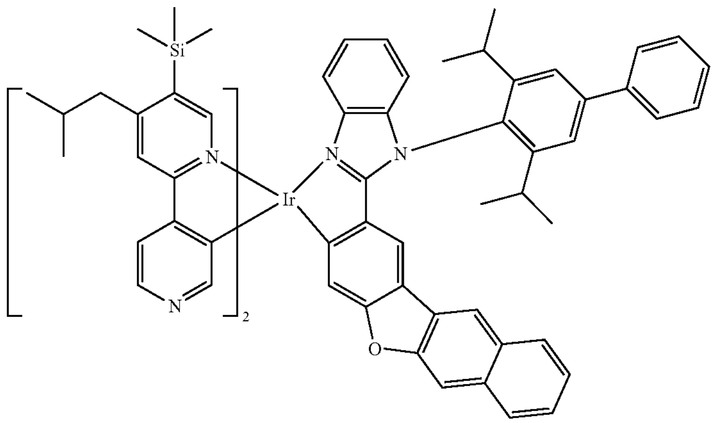
1533
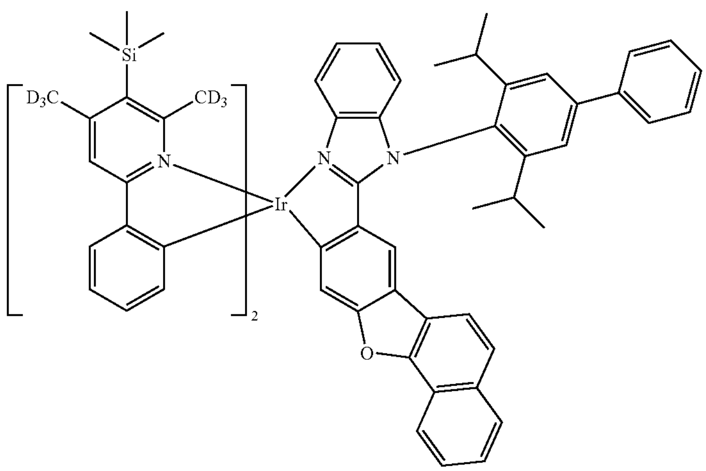
1534
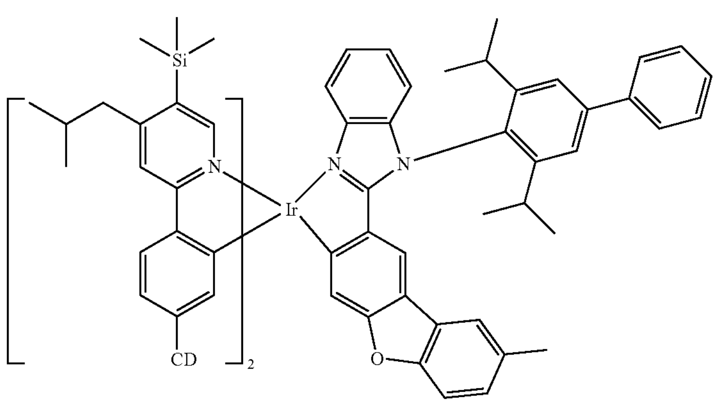

-continued
1535
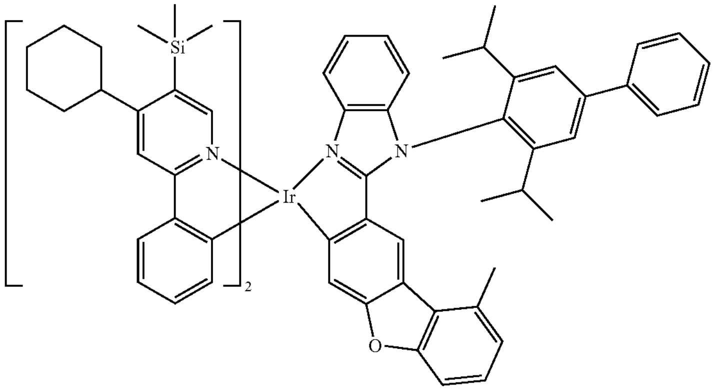
1536
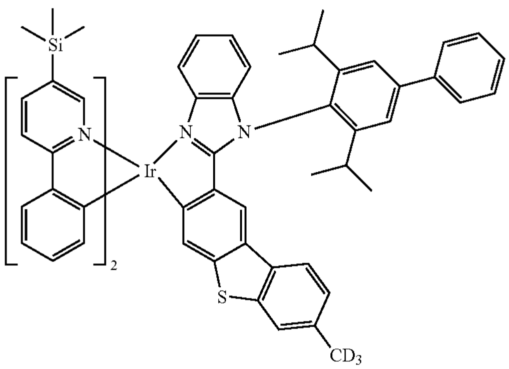
1537
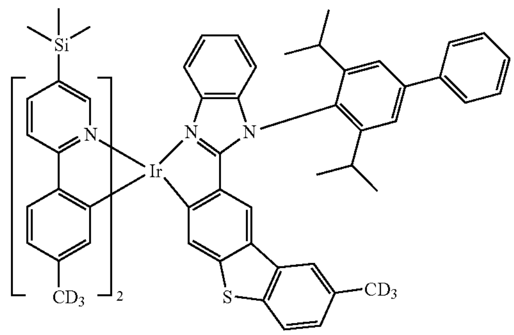
1538
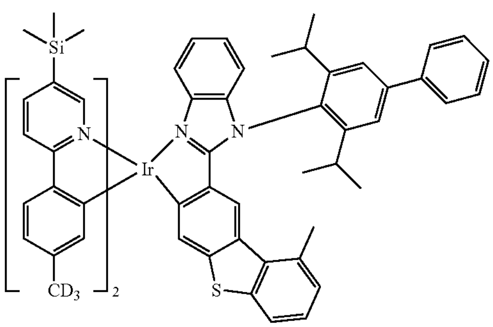
1539
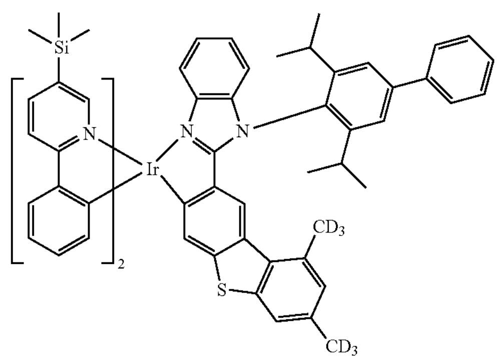
1540
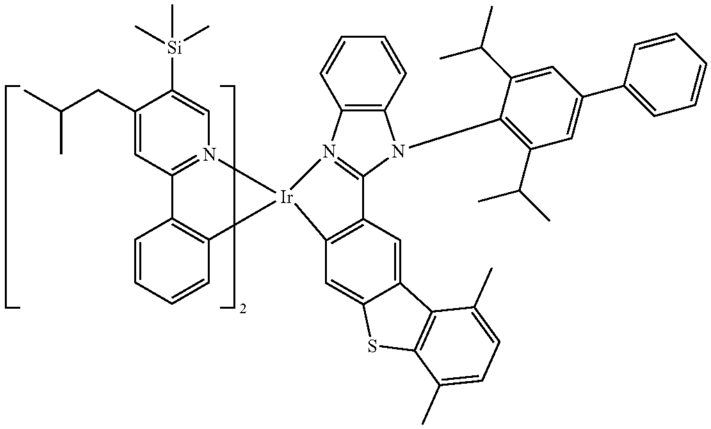

-continued
1541
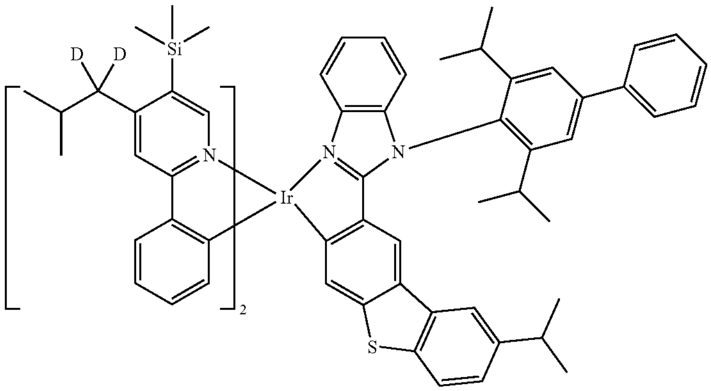
1542
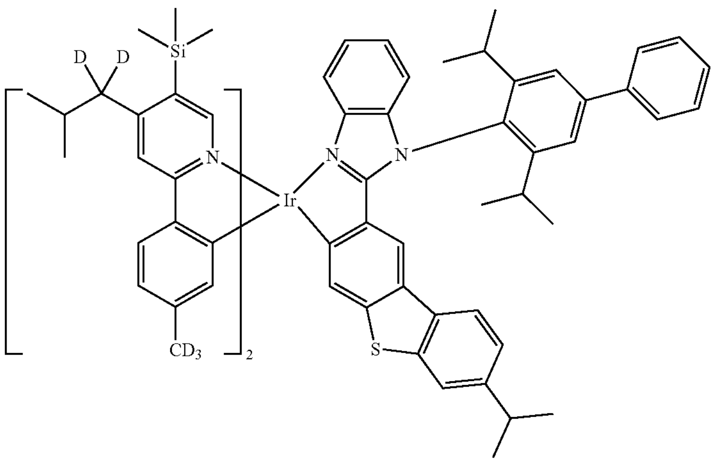
1543
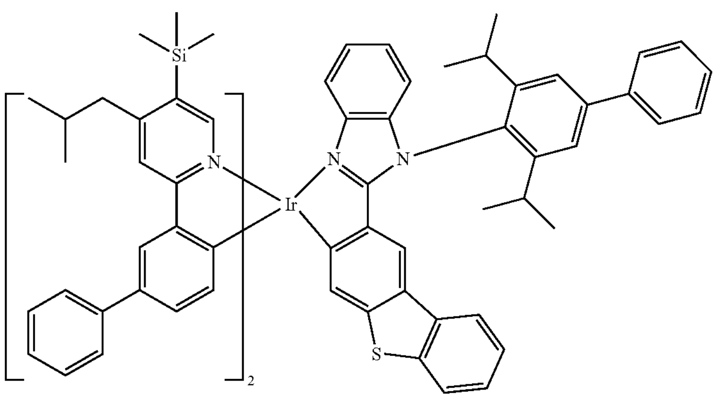
1544
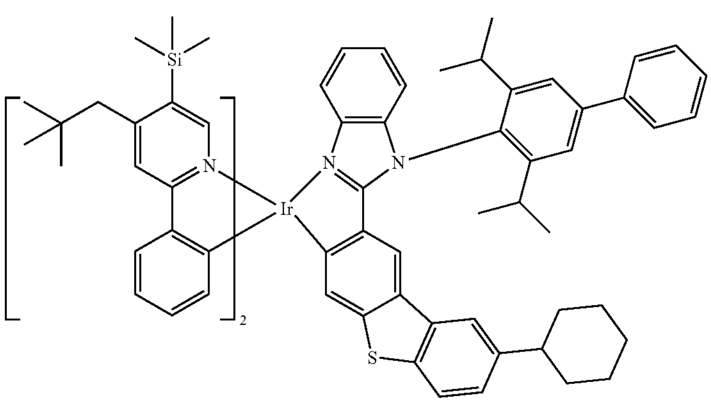

-continued
1545
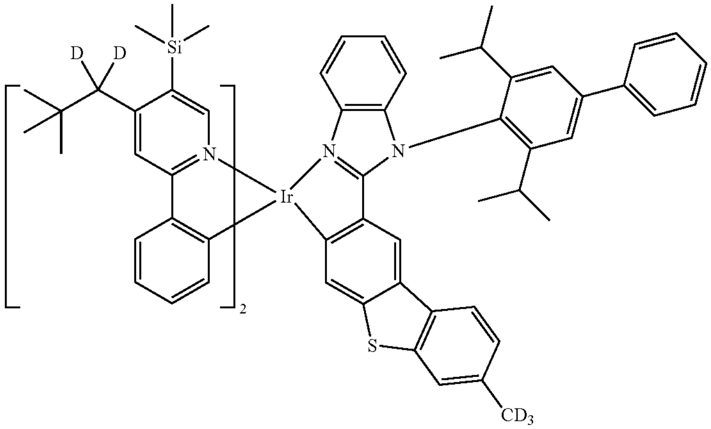
1546
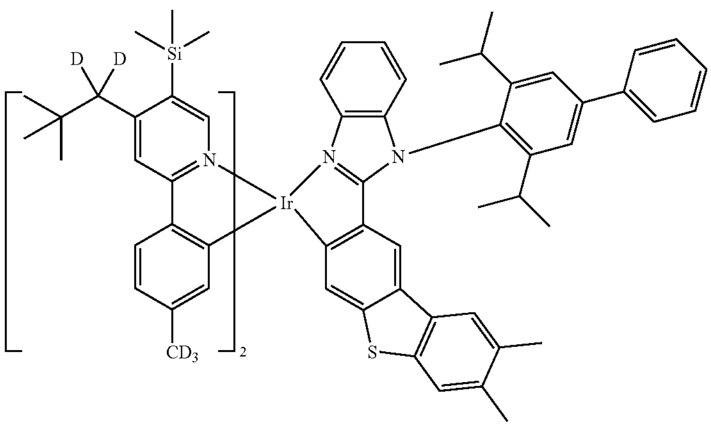
1547
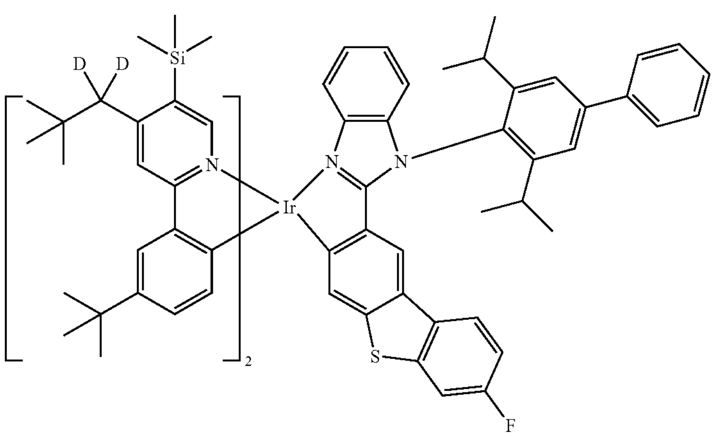

-continued
1548
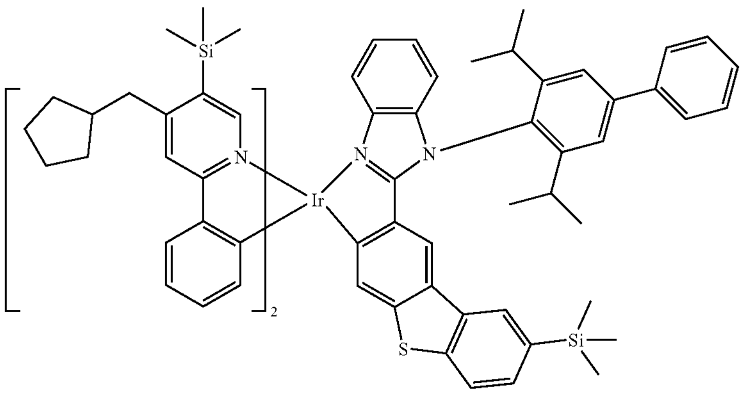
1549
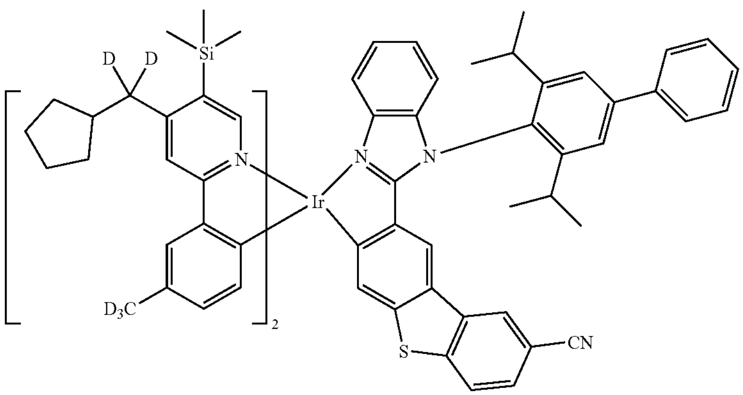
1550
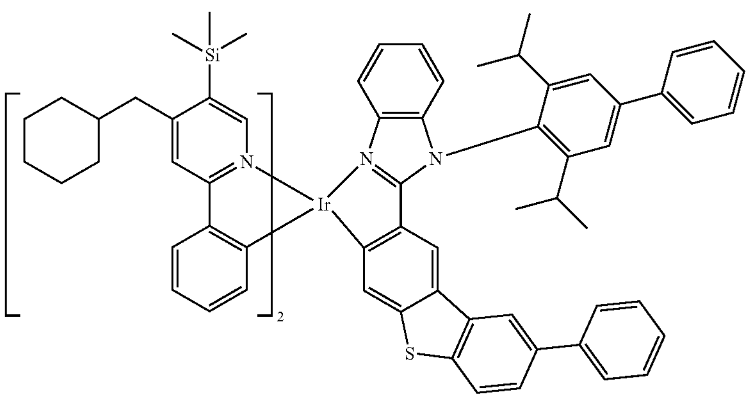
1551
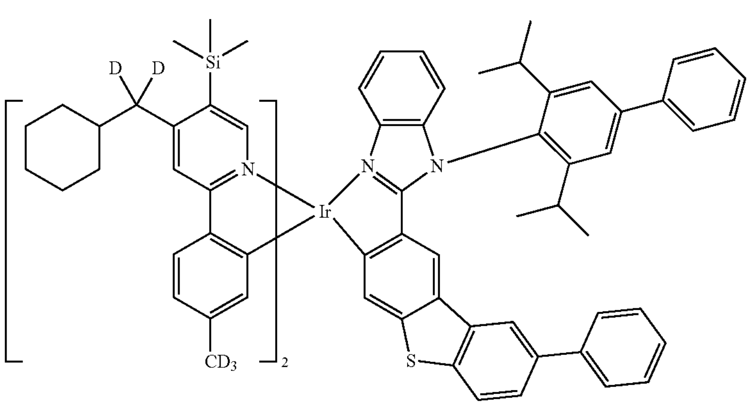

-continued
1552
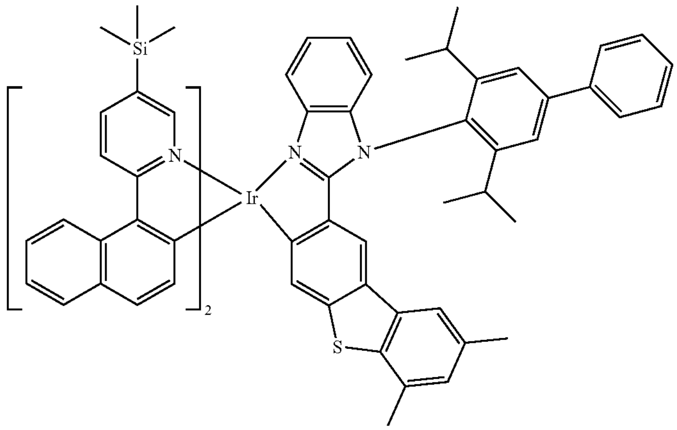
1553
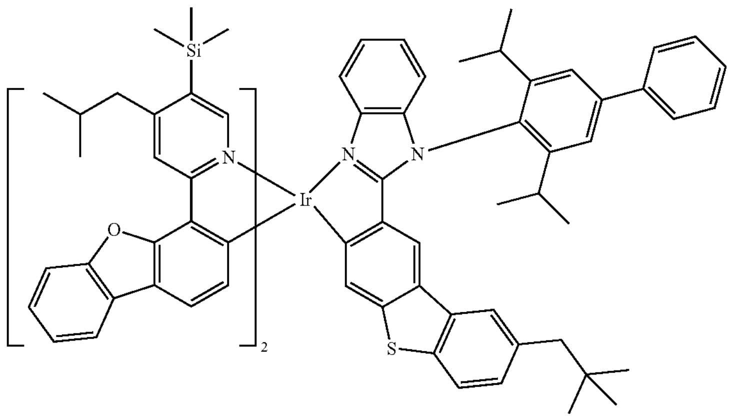
1554
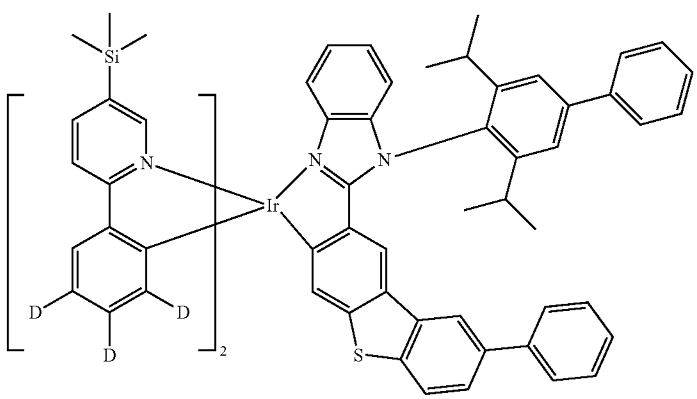
1555
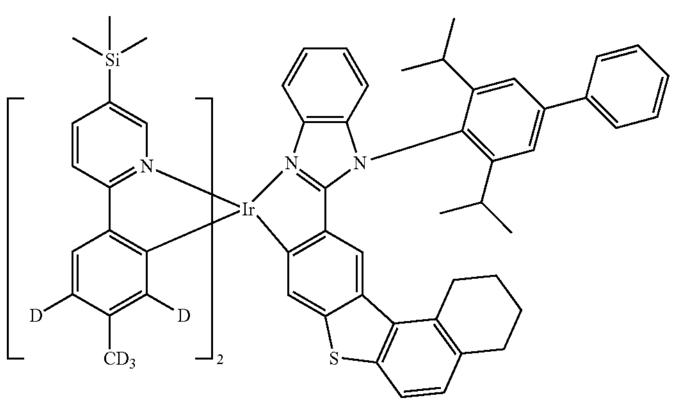

-continued
1556
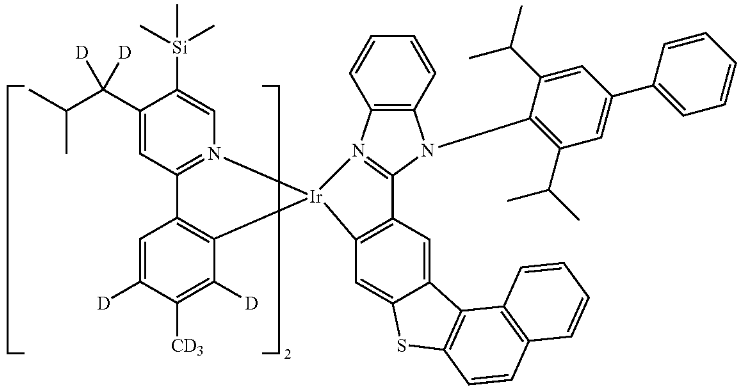
1557
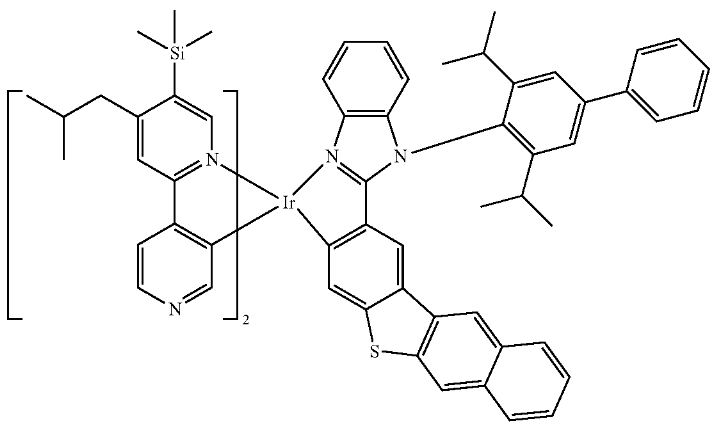
1558
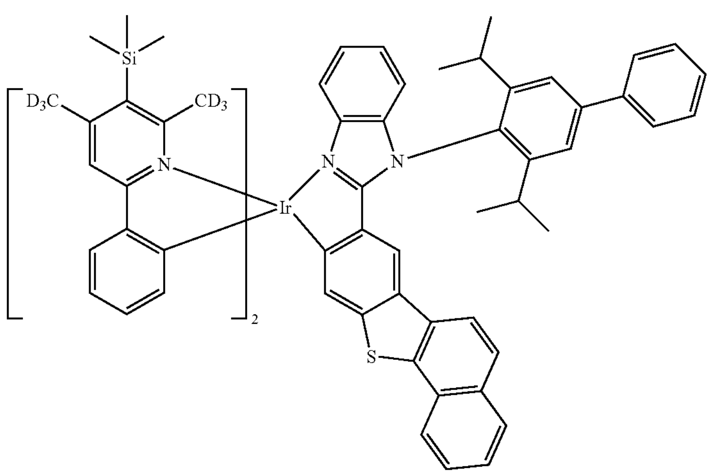

-continued
1559
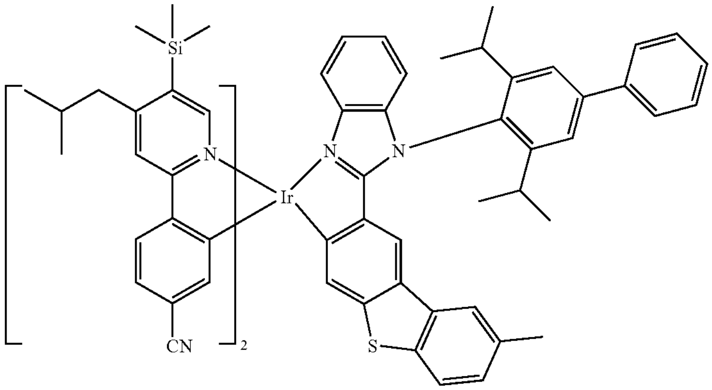
1560
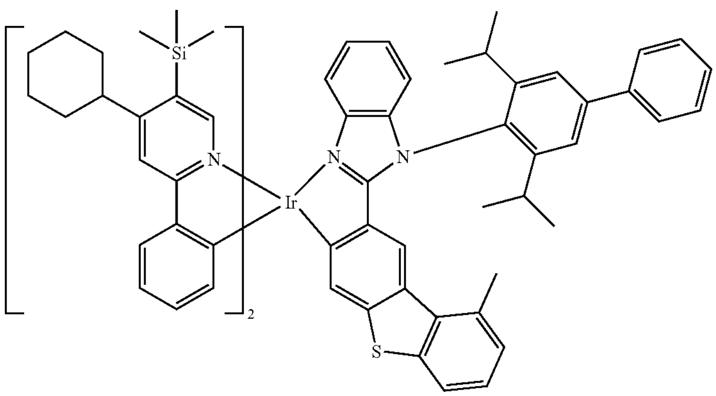
1561
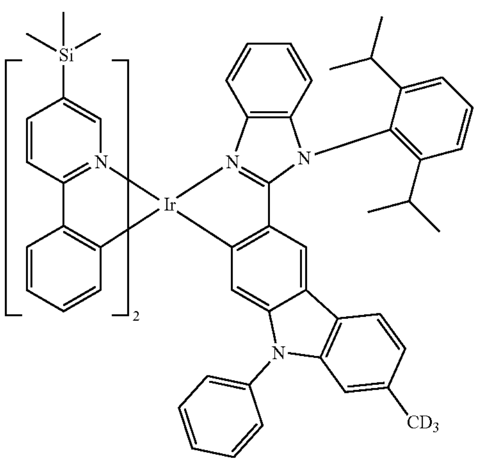
1562
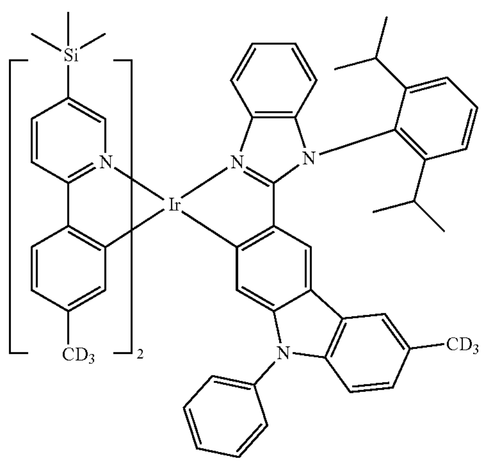

-continued
1563
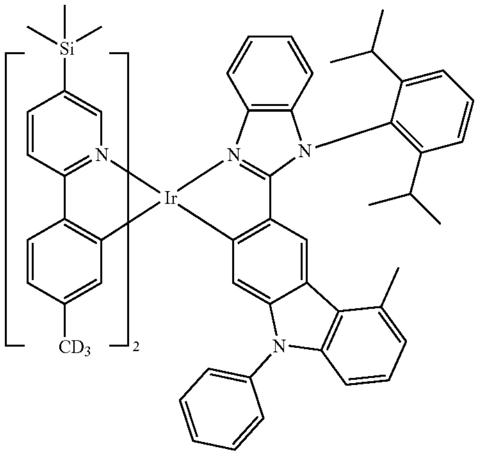
1564
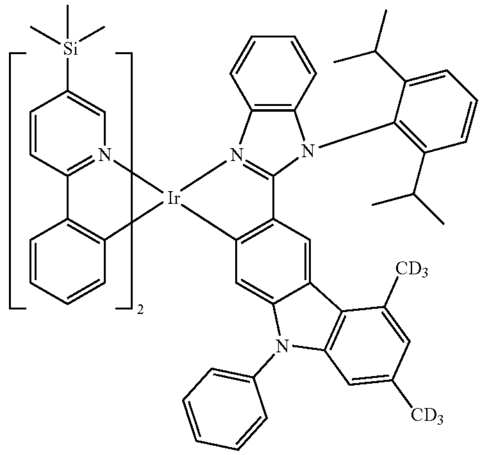
1565
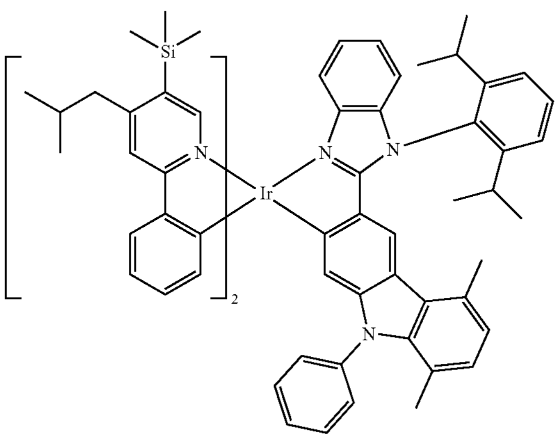
1566
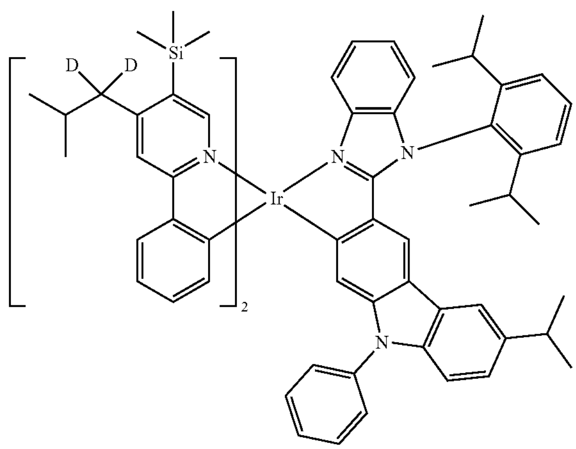
1567
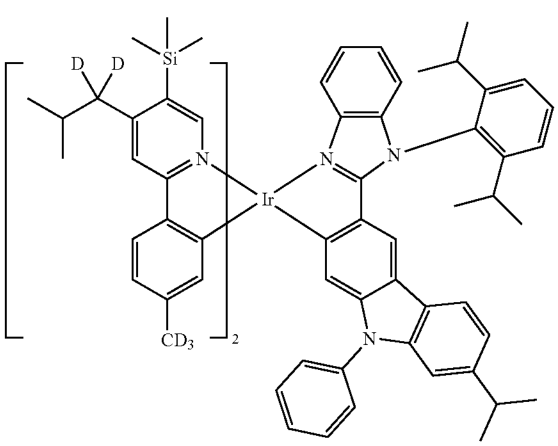
1568
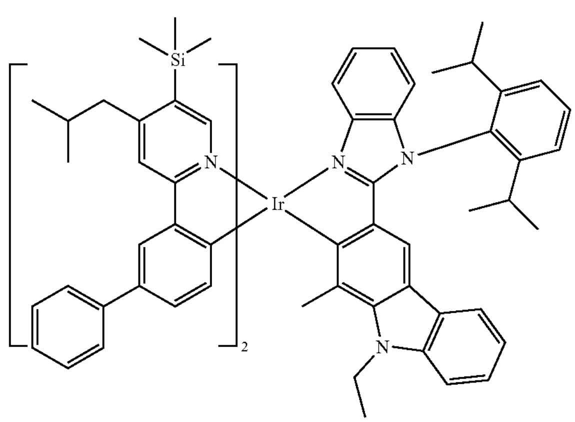

-continued
1569
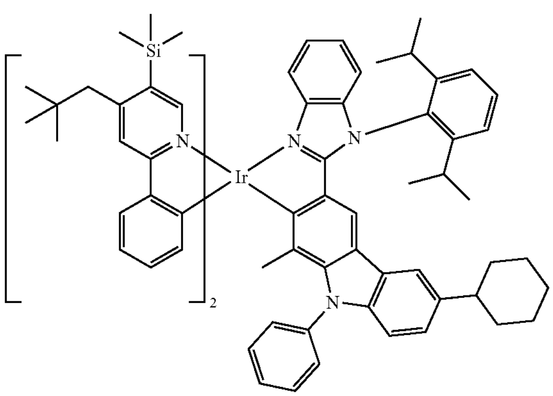
1570
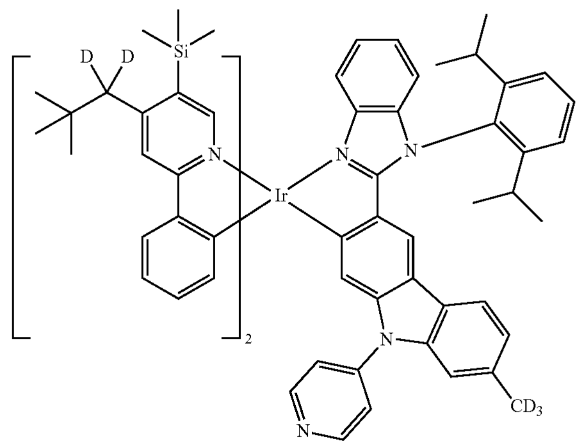
1571
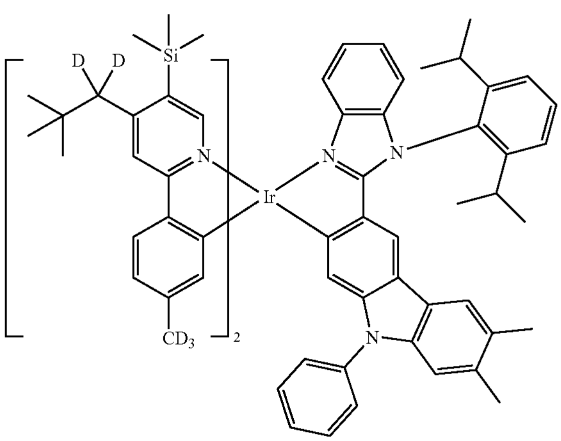
1572
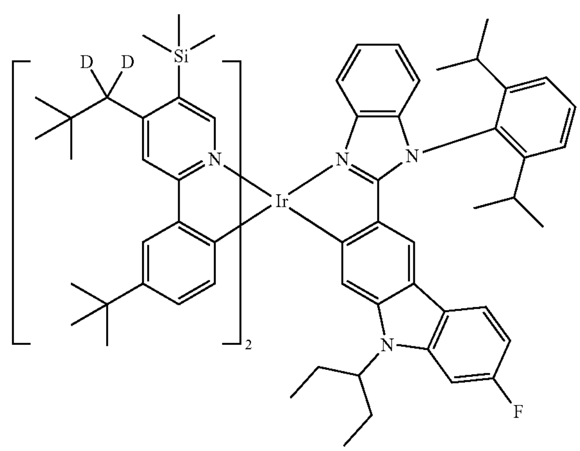
1573
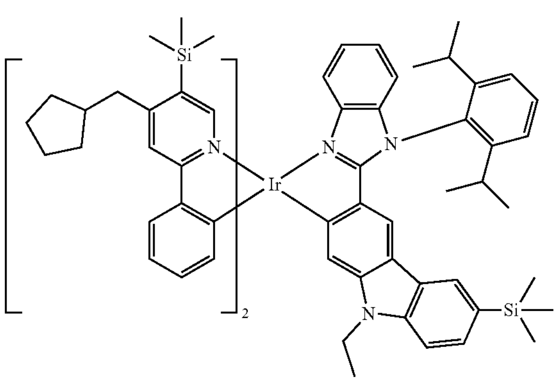
1574
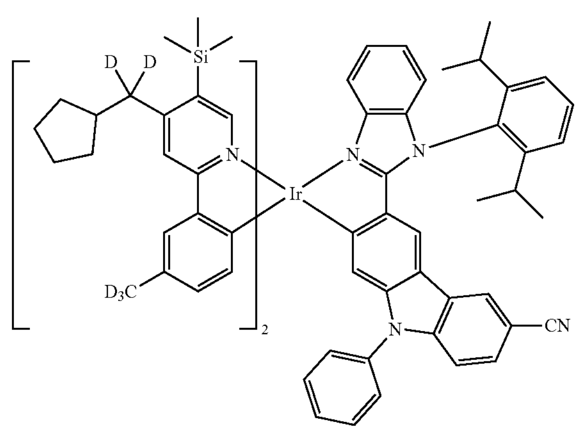

-continued
1575
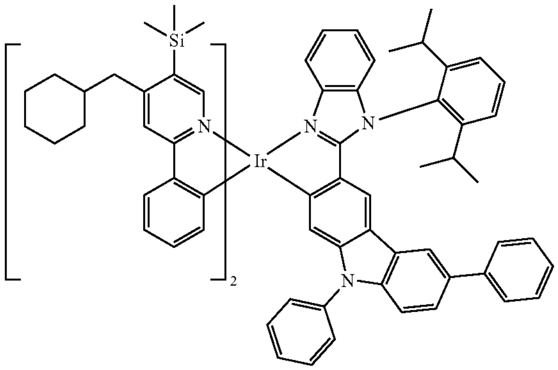
1576
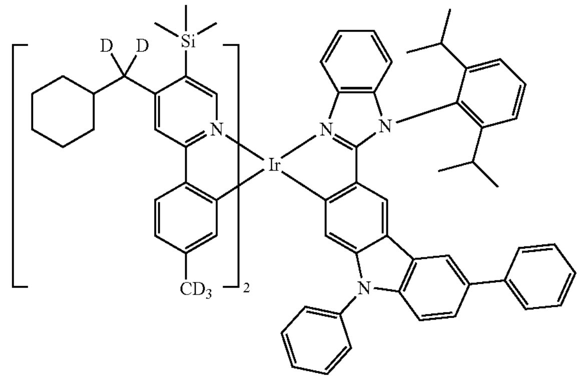
1577
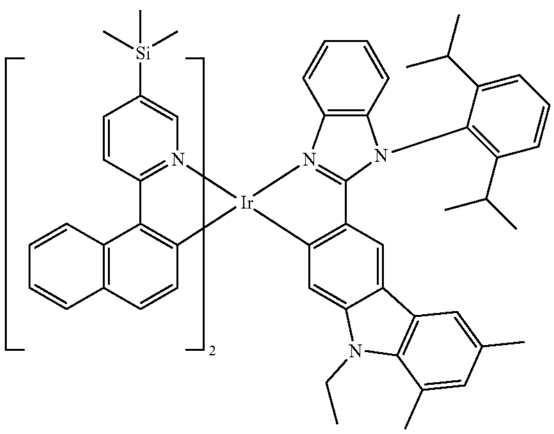
1578
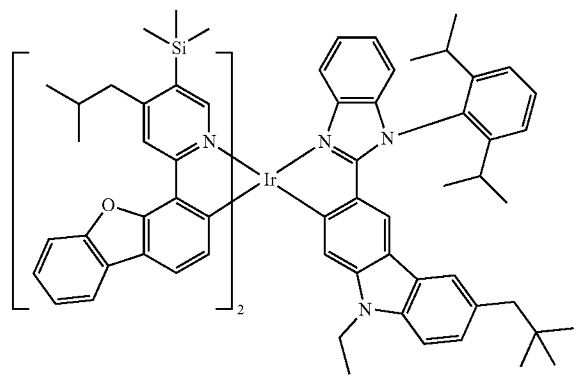
1579
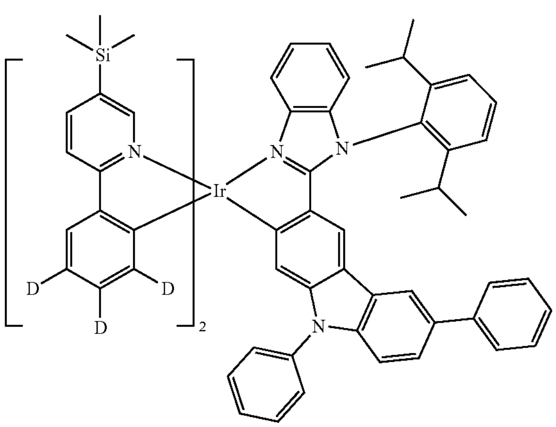
1580
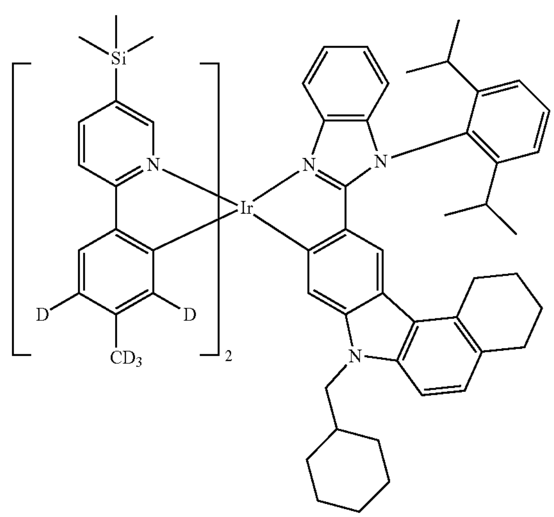

-continued
1581
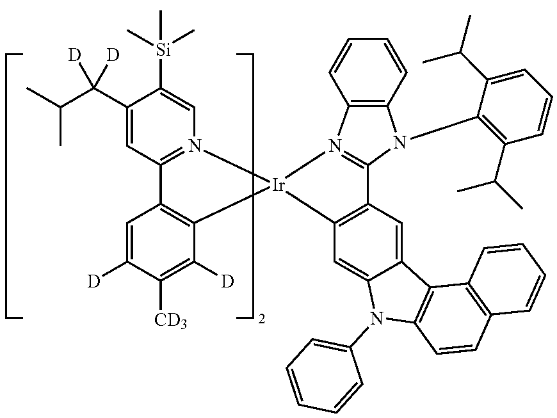
1582
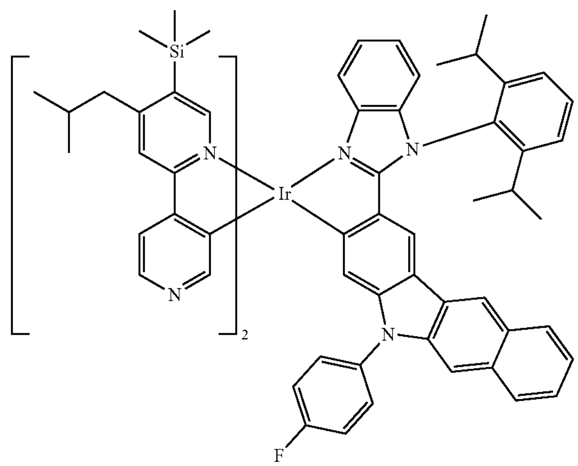
1583
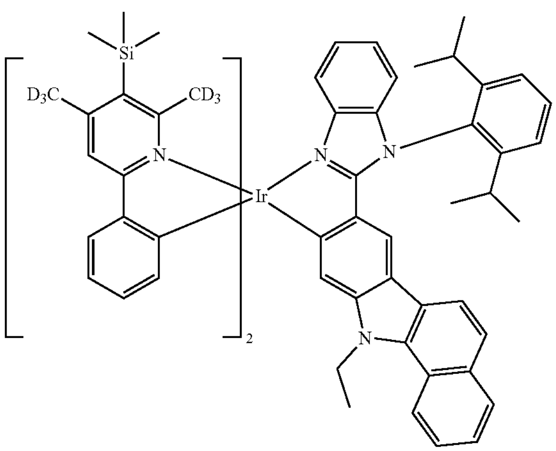
1584
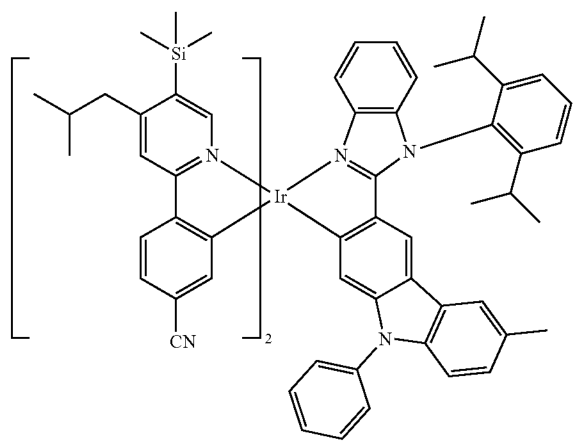
1585
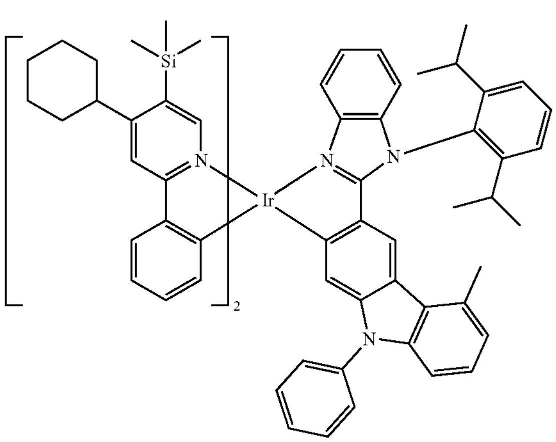
1586
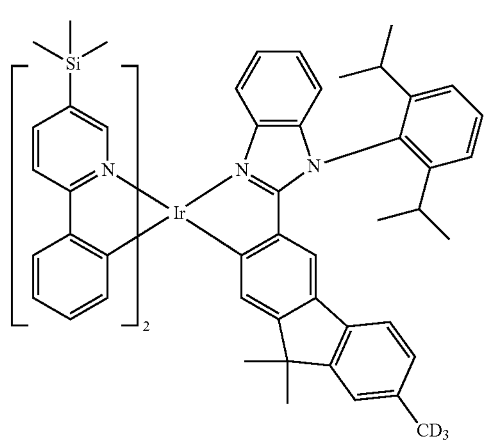

-continued
1587
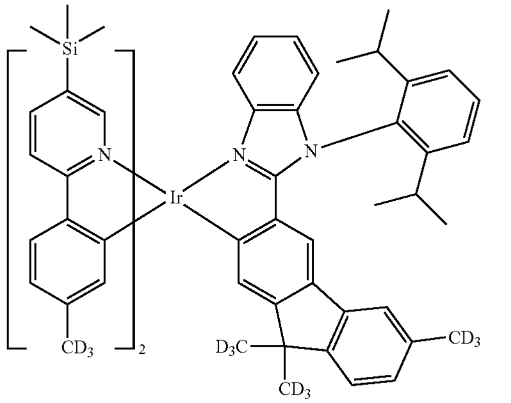
1588
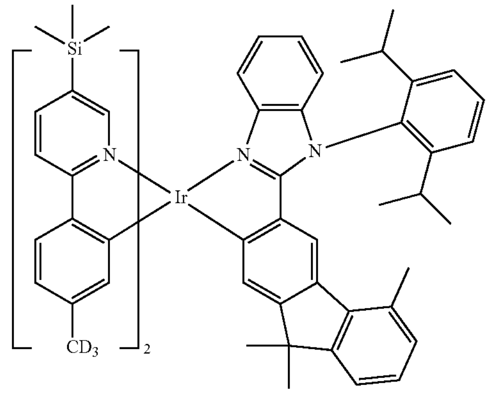
1589
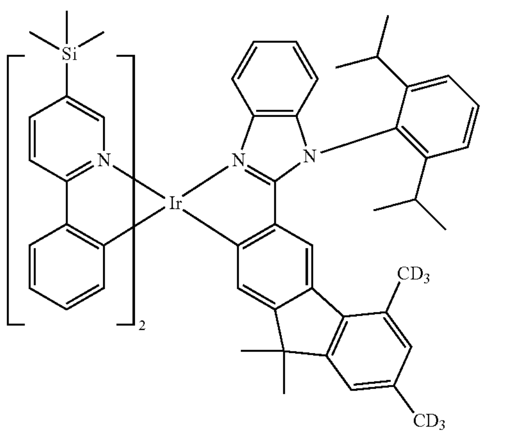
1590
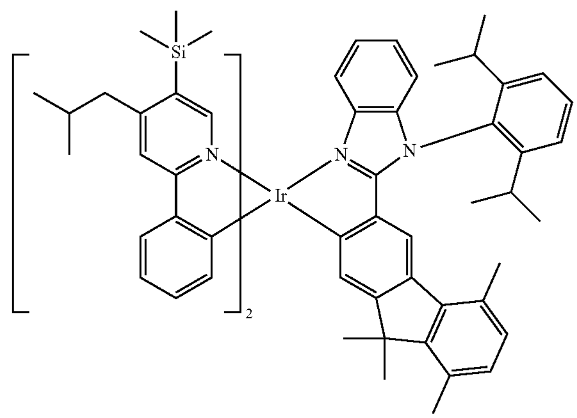
1591
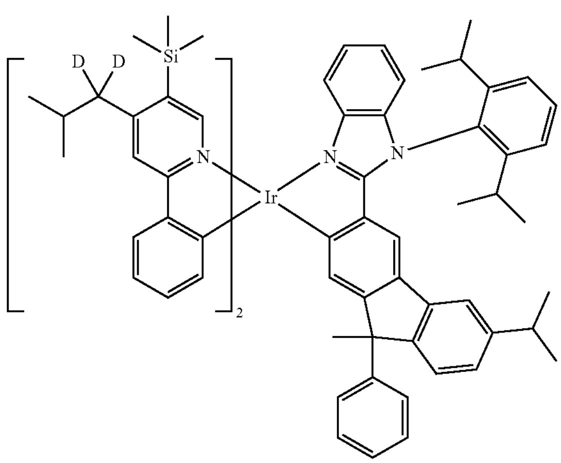
1592
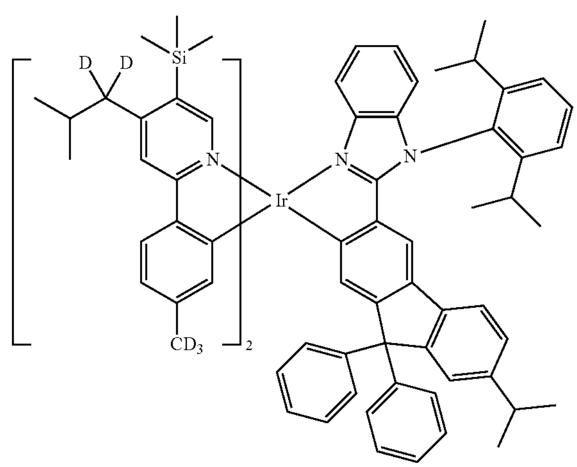

-continued
1593
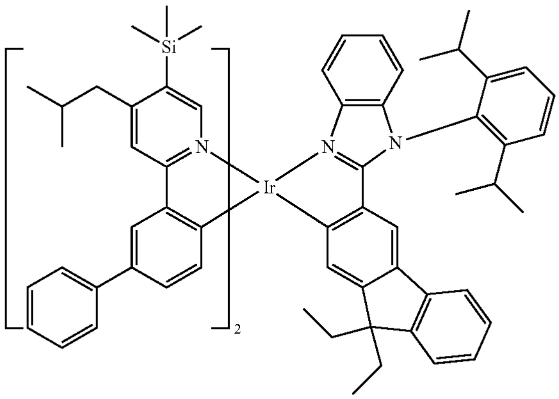
1594
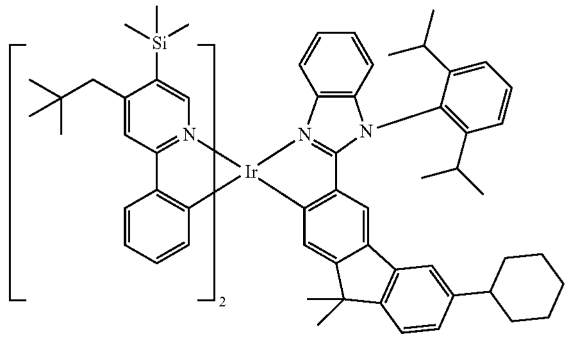
1595
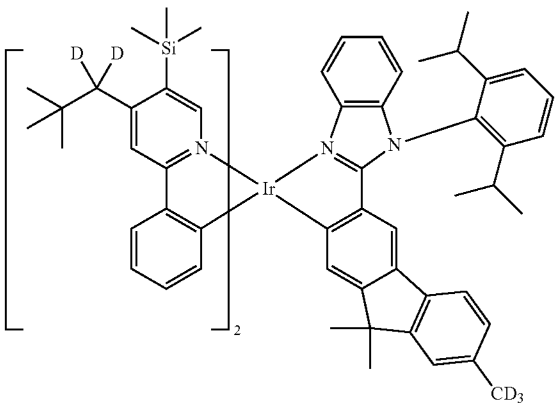
1596
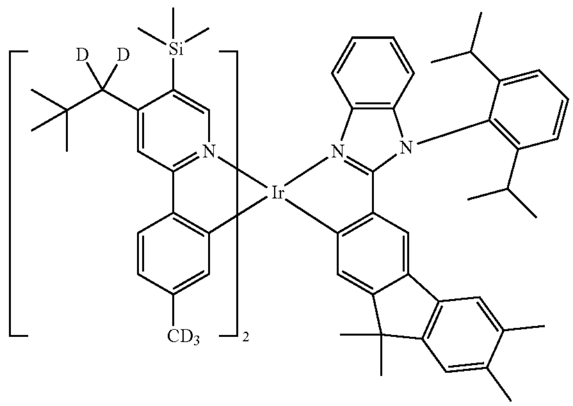
1597
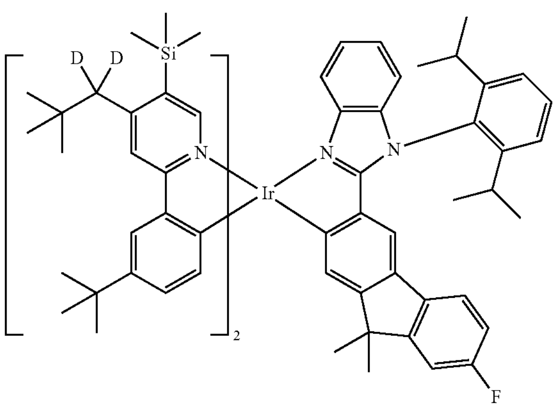
1598
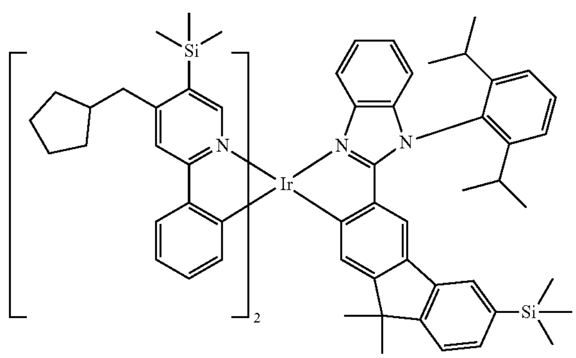
1599
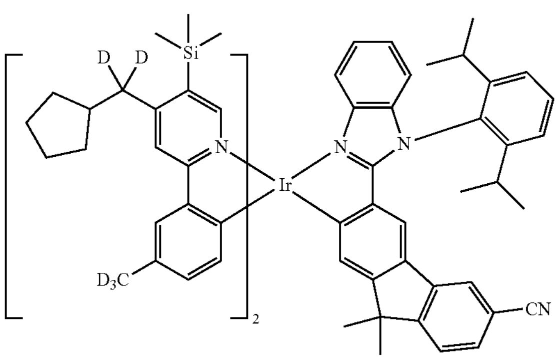
1600
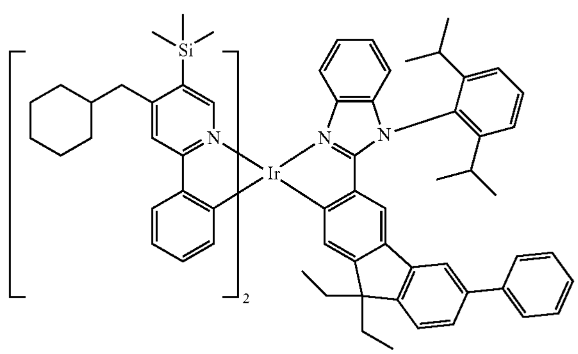

-continued
1601
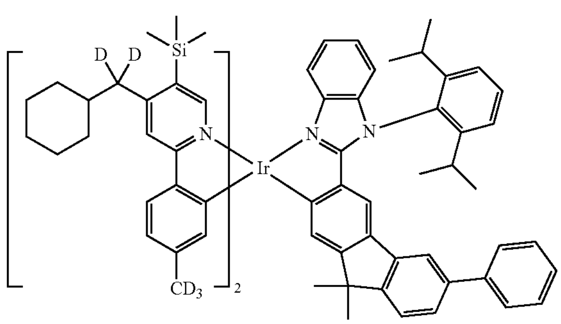
1602
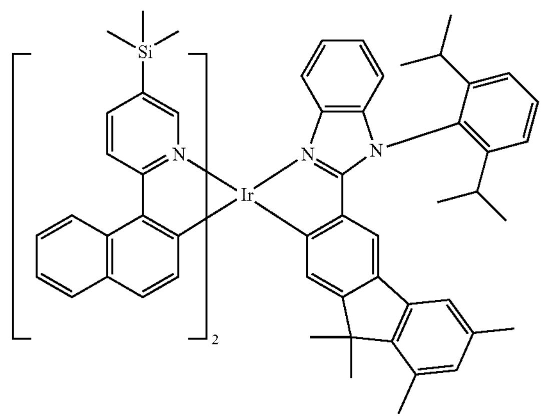
1603
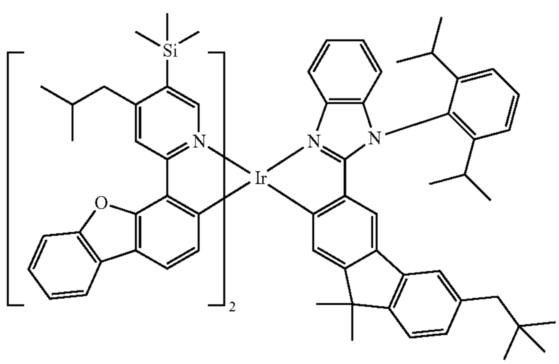
1604
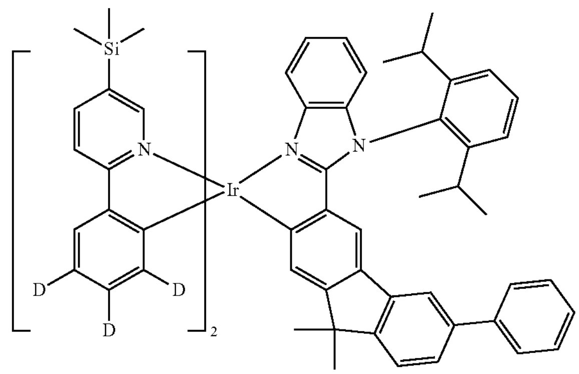
1605
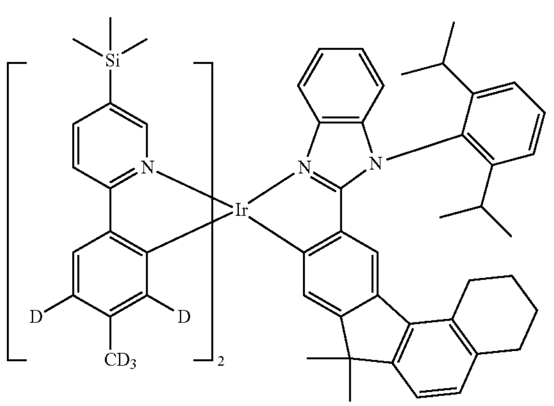
1606
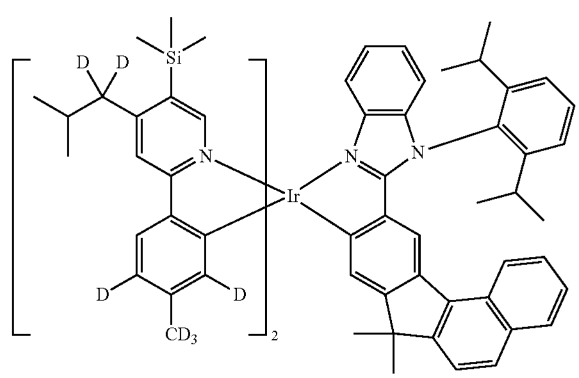

-continued
1607
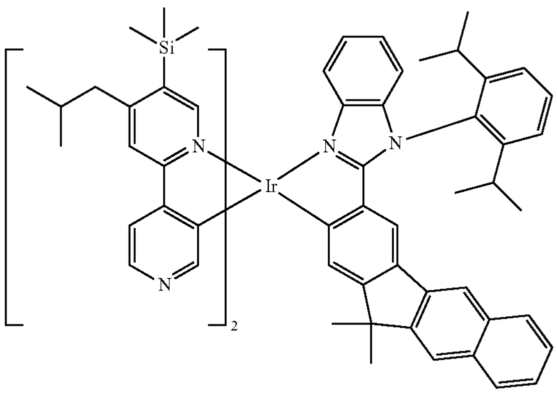
1608
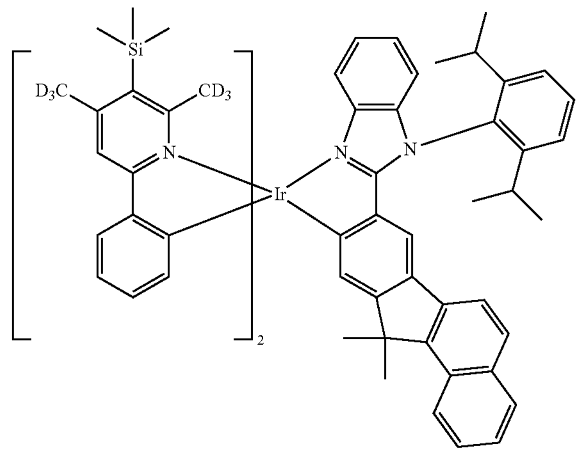
1609
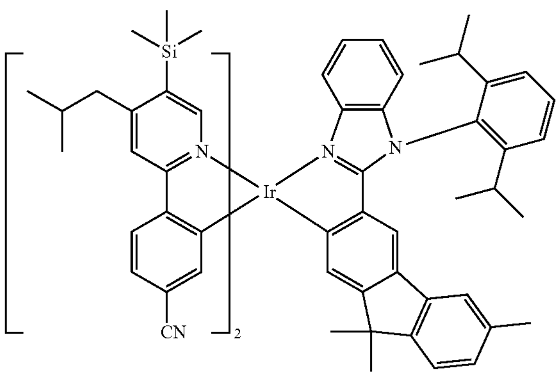
1610
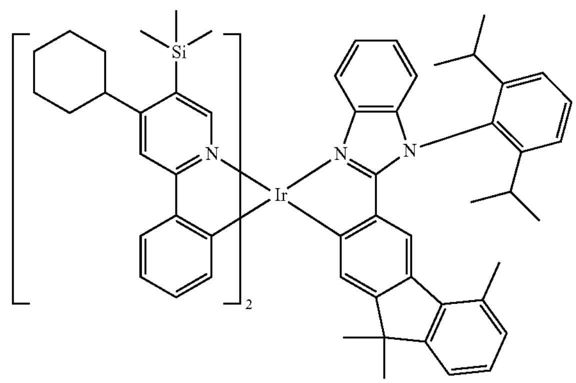
1611
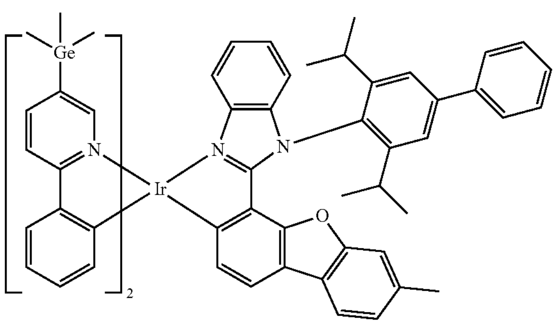
1612
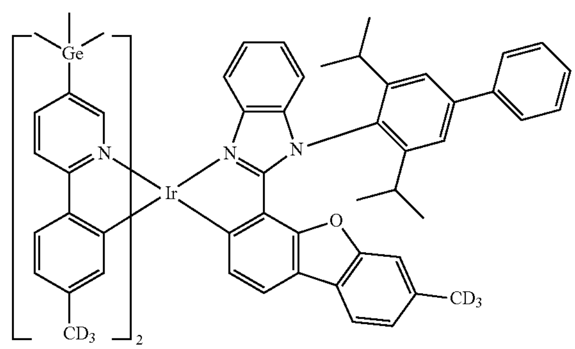
1613
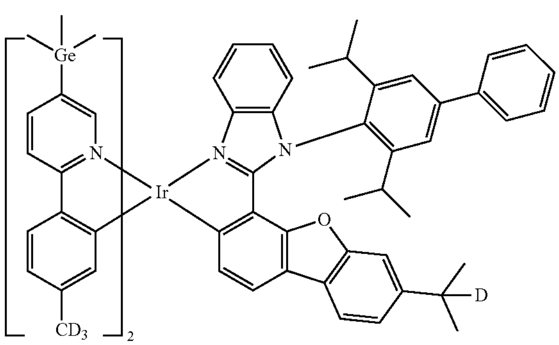
1614
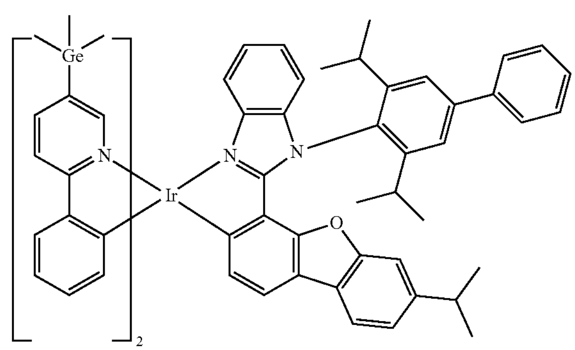

-continued
1615
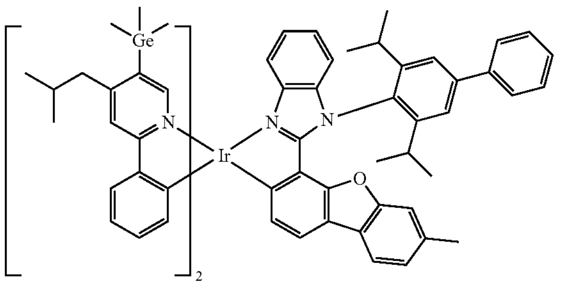
1616
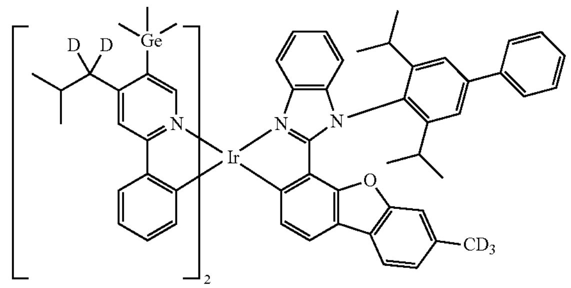
1617
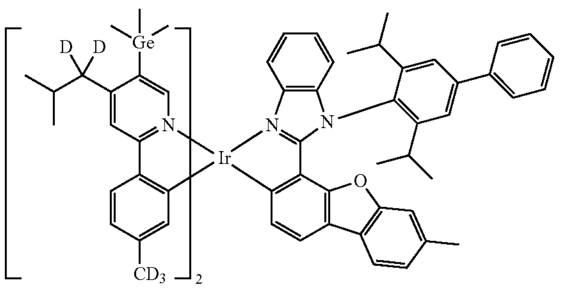
1618
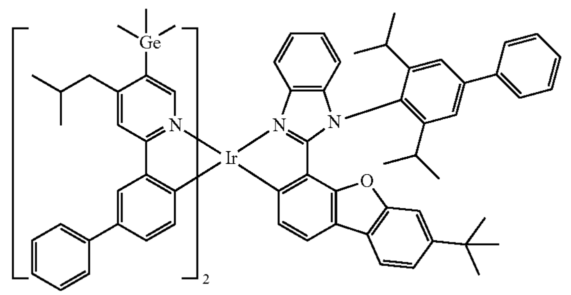
1619
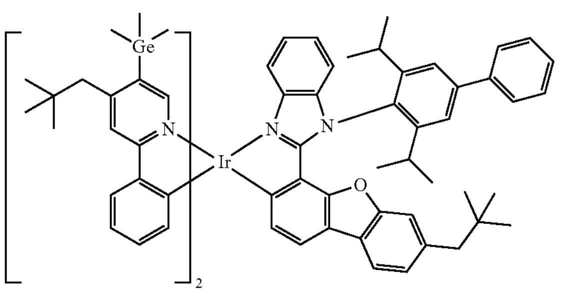
1620
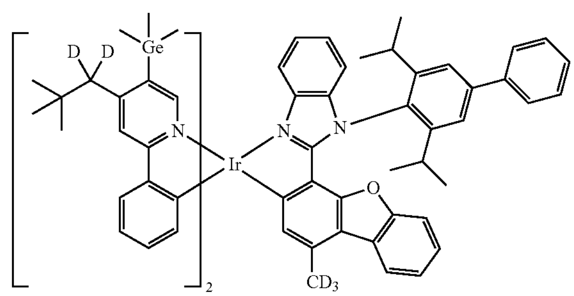
1621
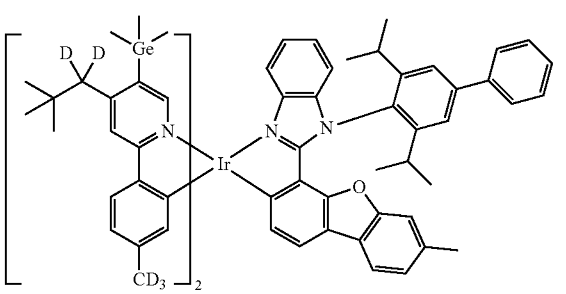
1622
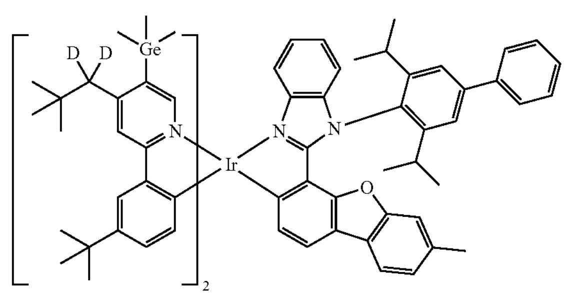
1623
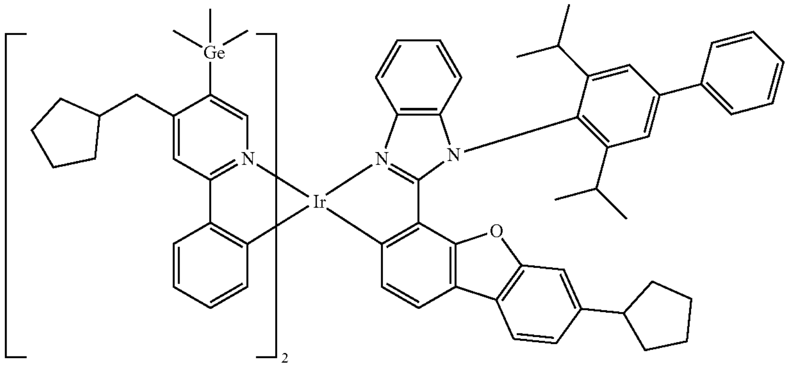

-continued
1624
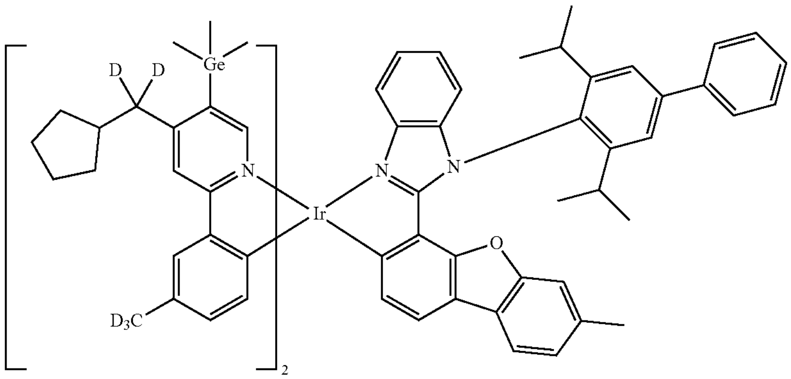
1625
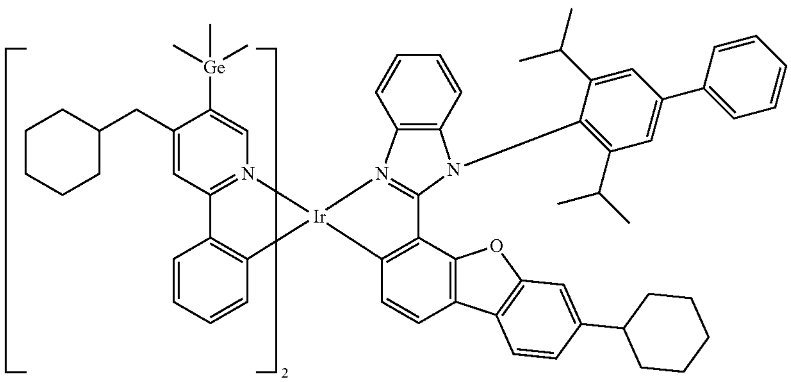
1626
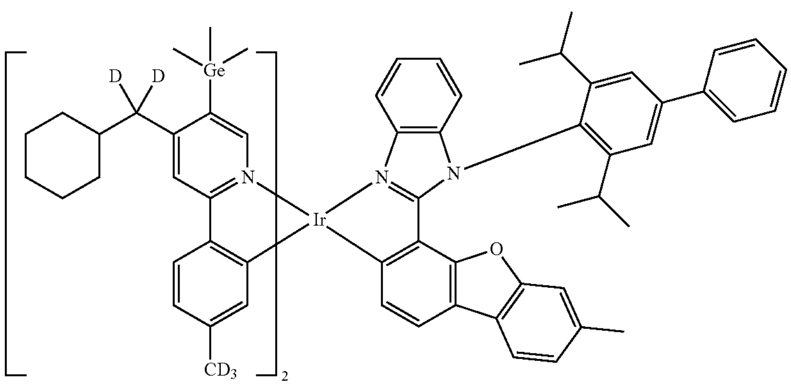
1627
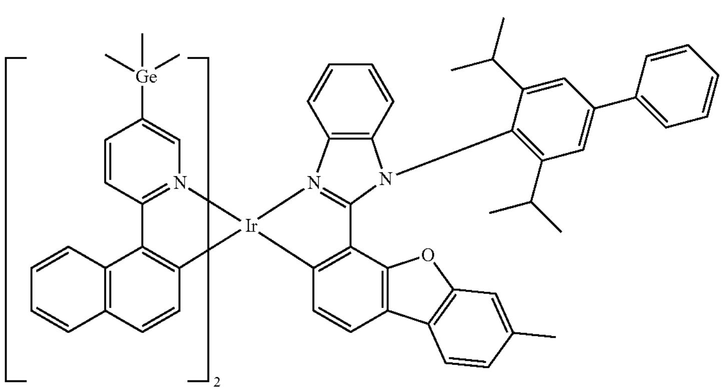

-continued
1628
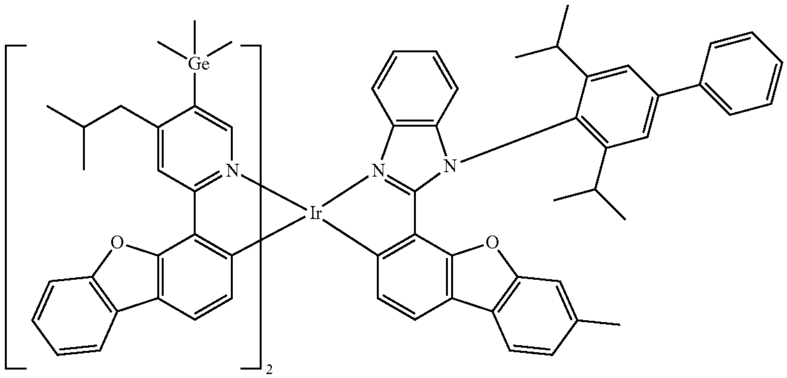
1629
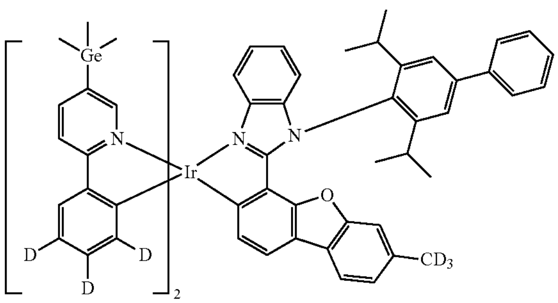
1630
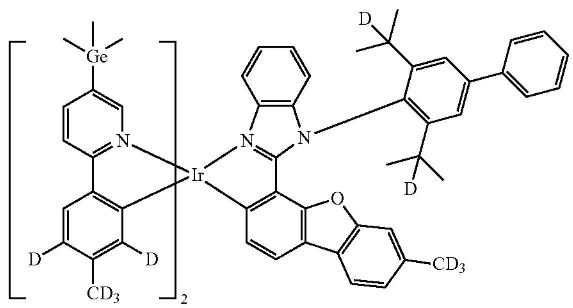
1631
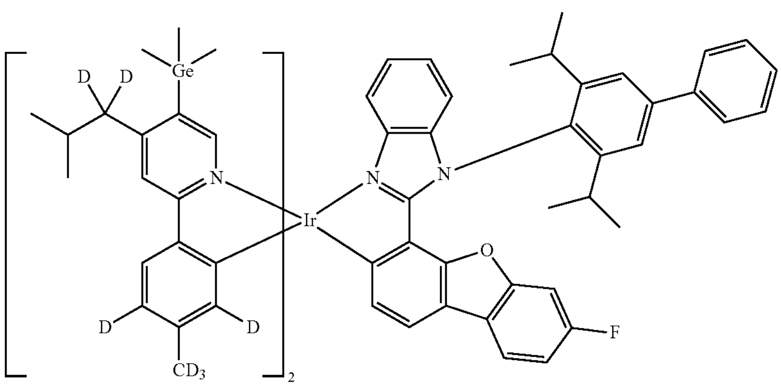
1632
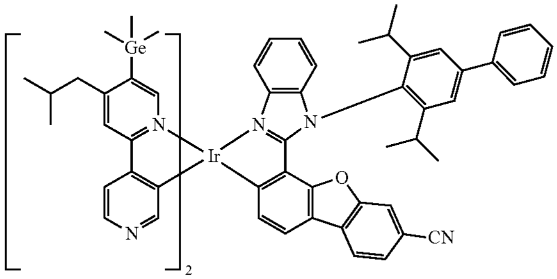
1633
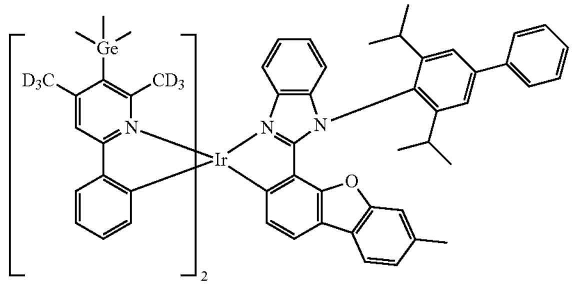

-continued
1634
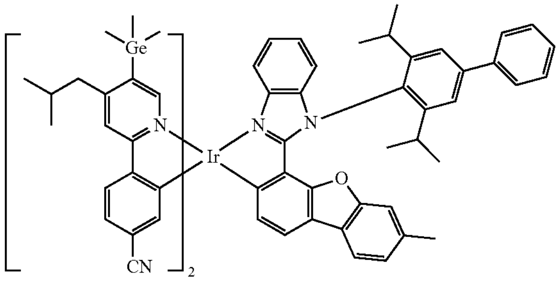
1635
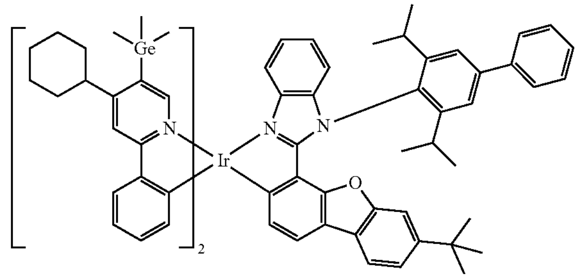
1636
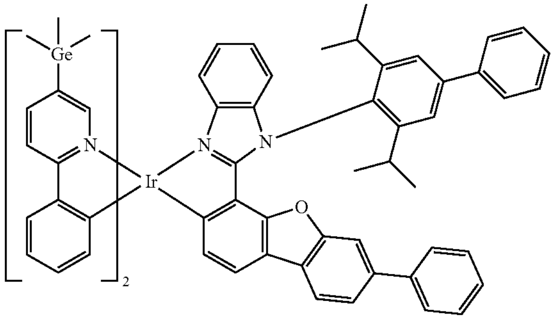
1637
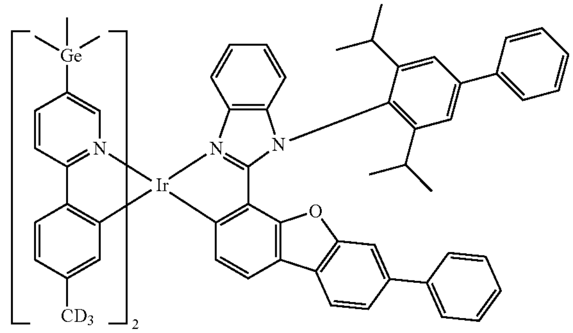
1638
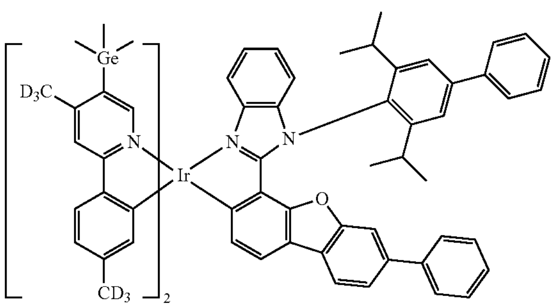
1639
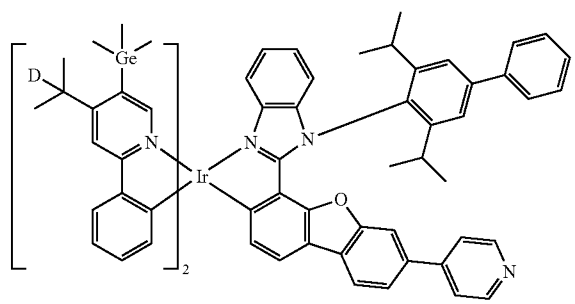
1640
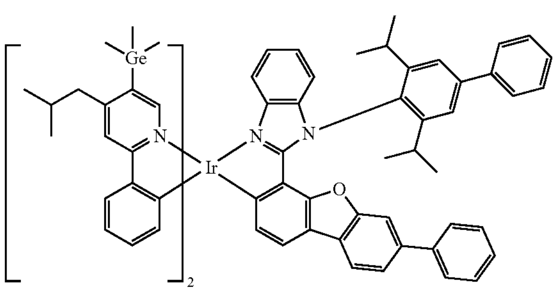
1641
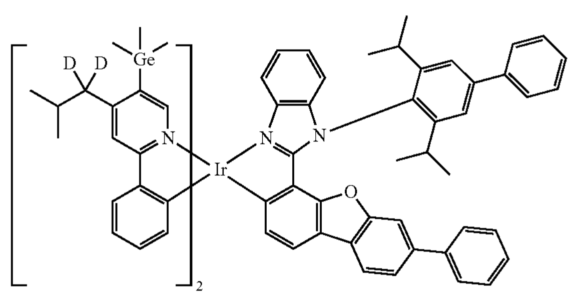
1642
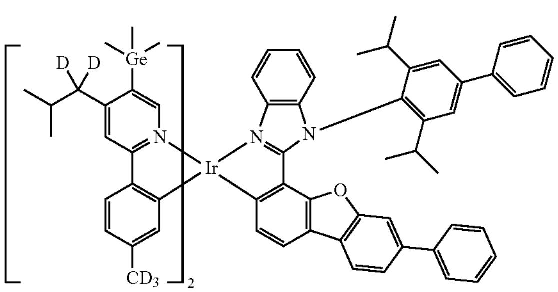
1643
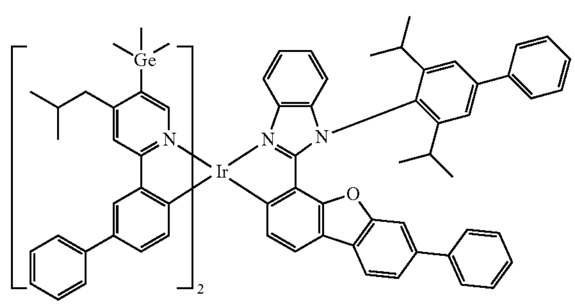

-continued
1644
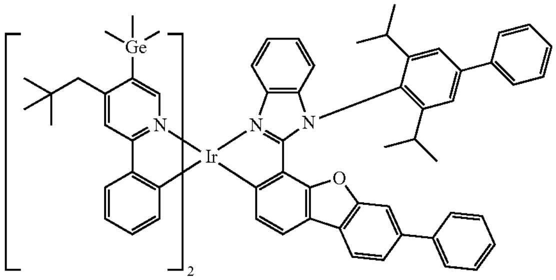
1645
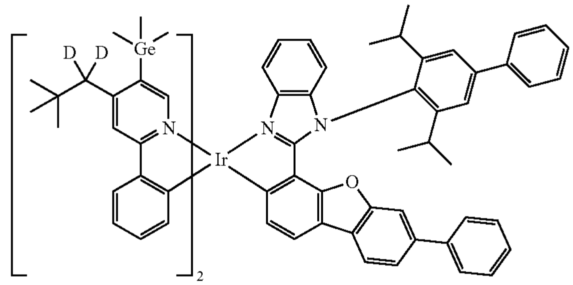
1646
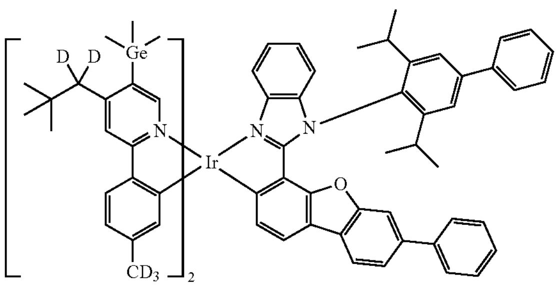
1647
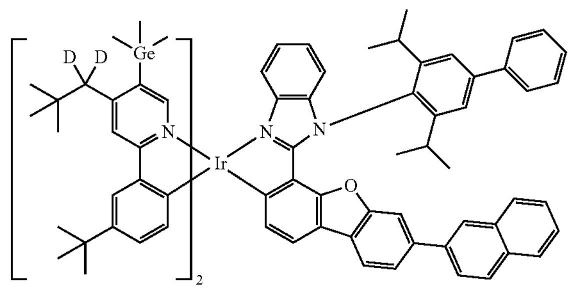
1648
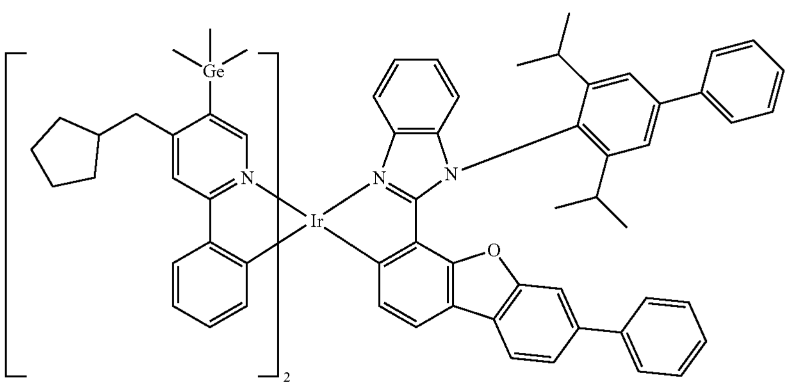
1649
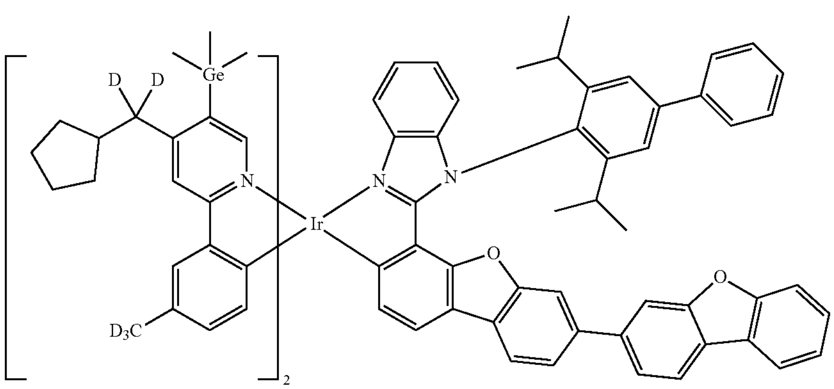

-continued
1650
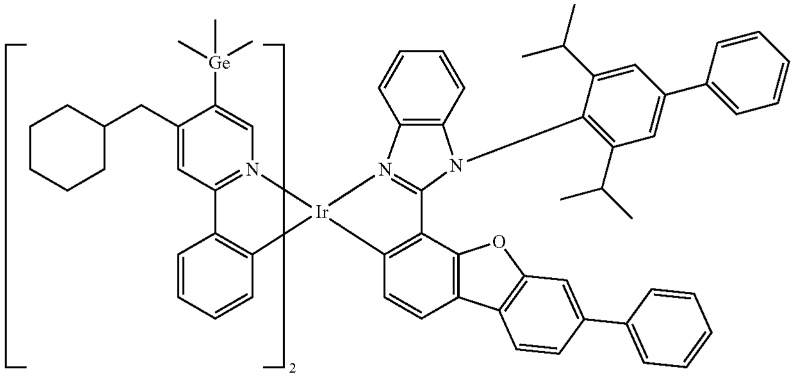
1651
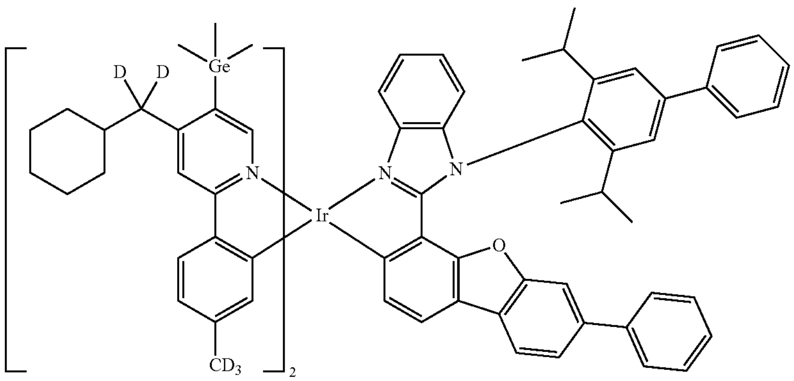
1652
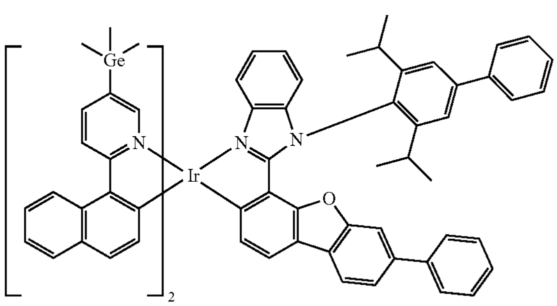
1653
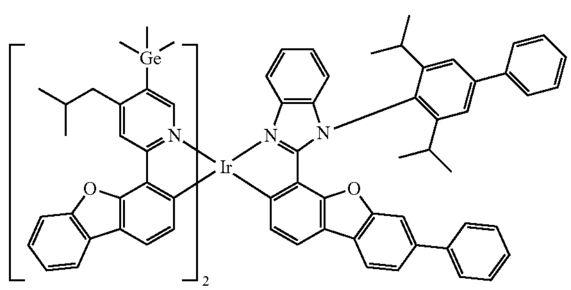
1654
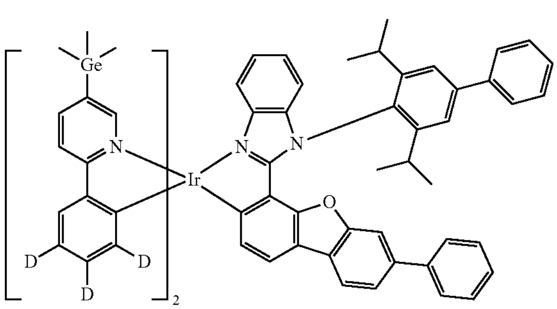
1655
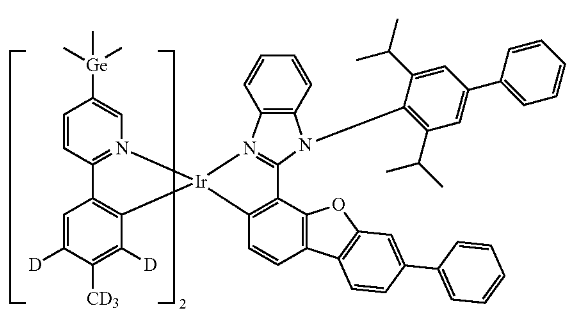

-continued
1656
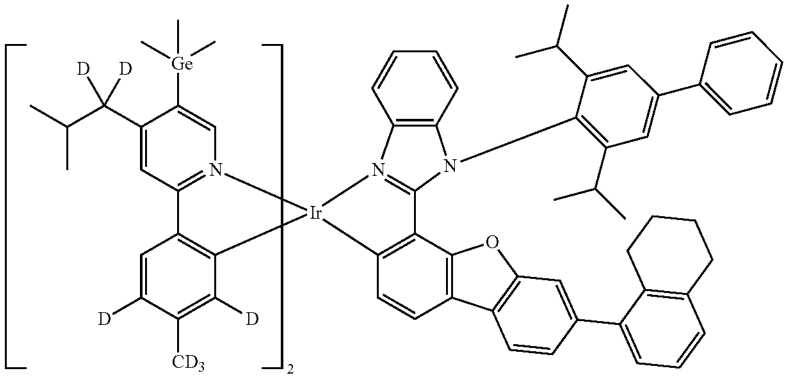
1657
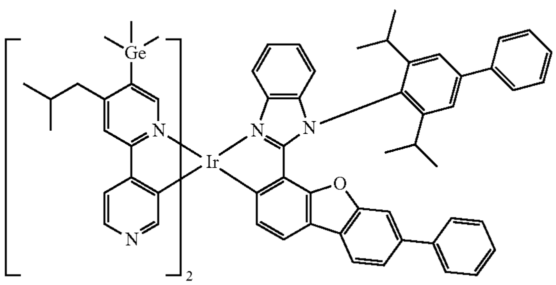
1658
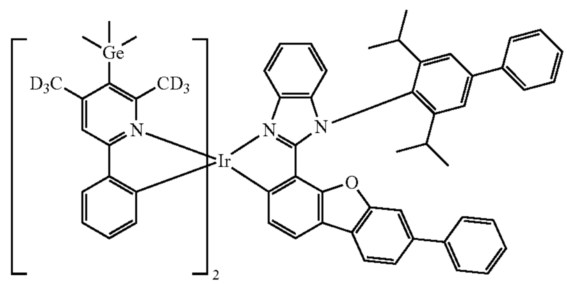
1659
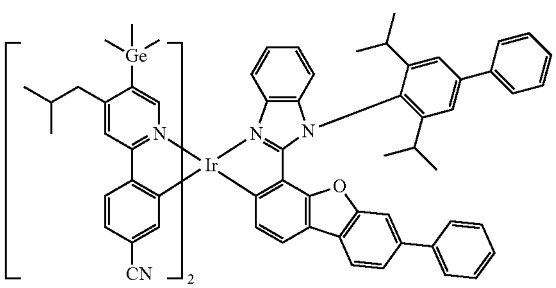
1660
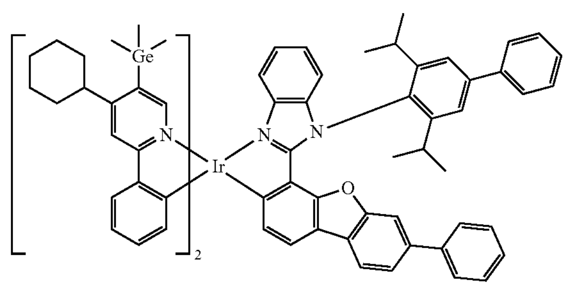
1661
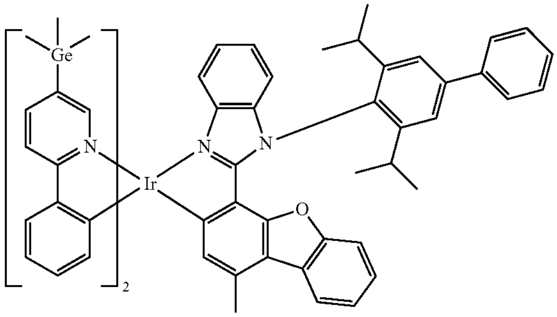
1662
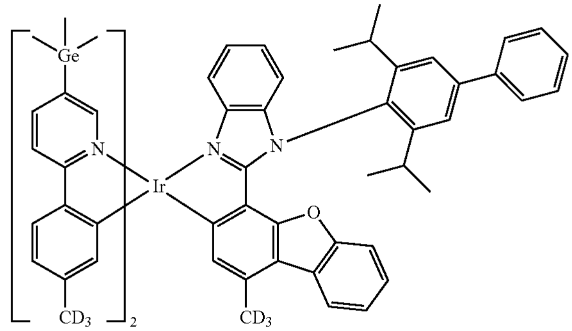

-continued
1663
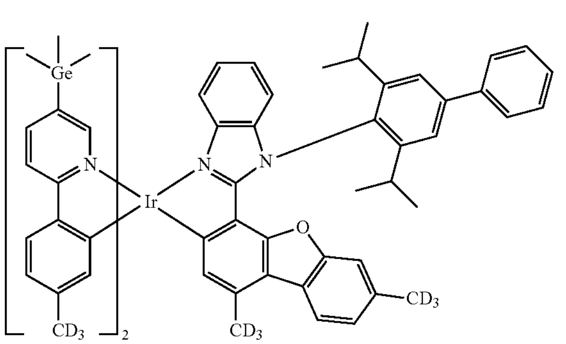
1664
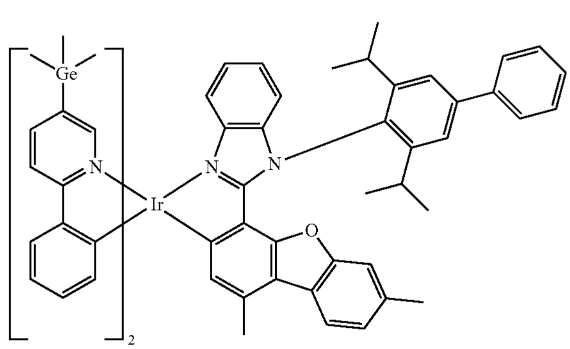
1665
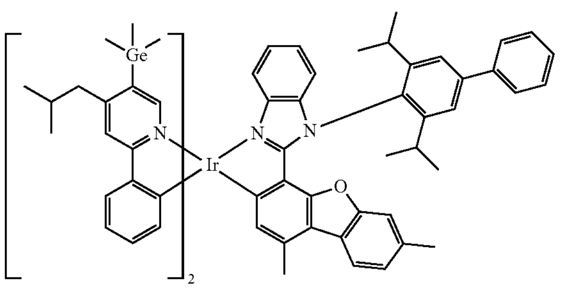
1666
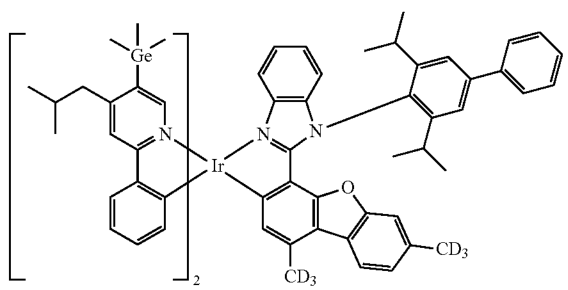
1667
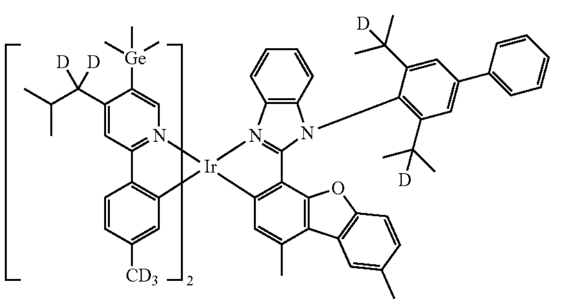
1668
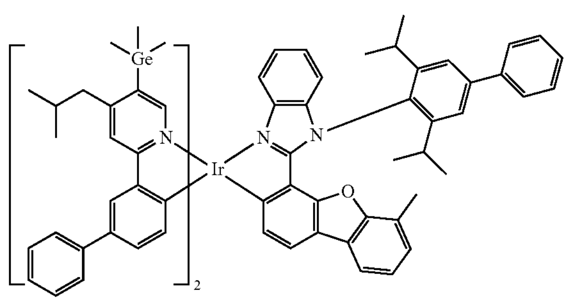
1669
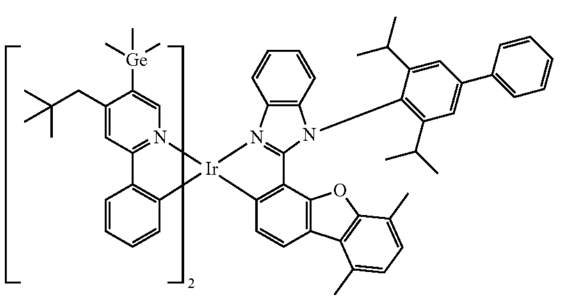
1670
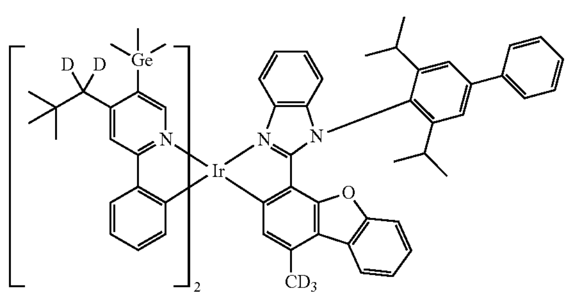
1671
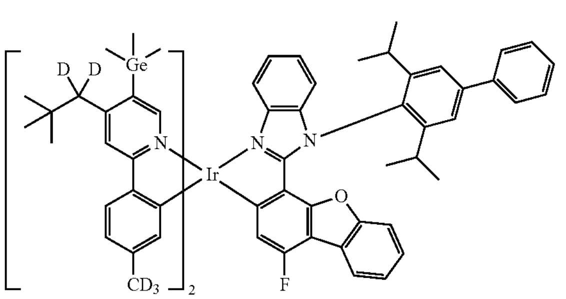
1672
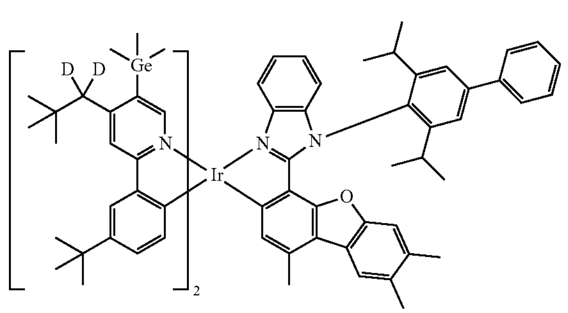

-continued
1673
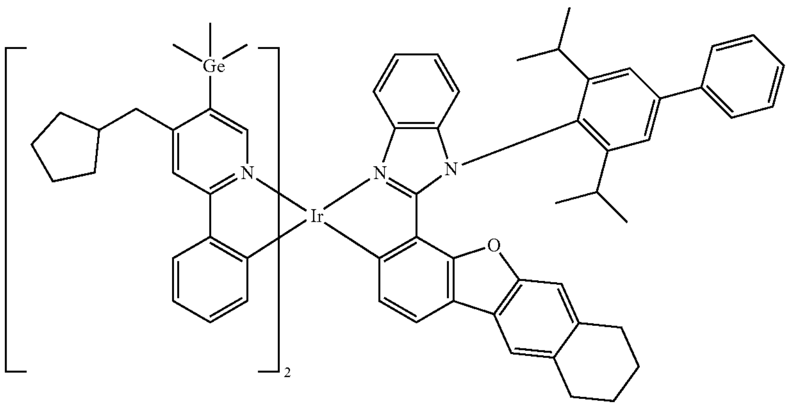
1674
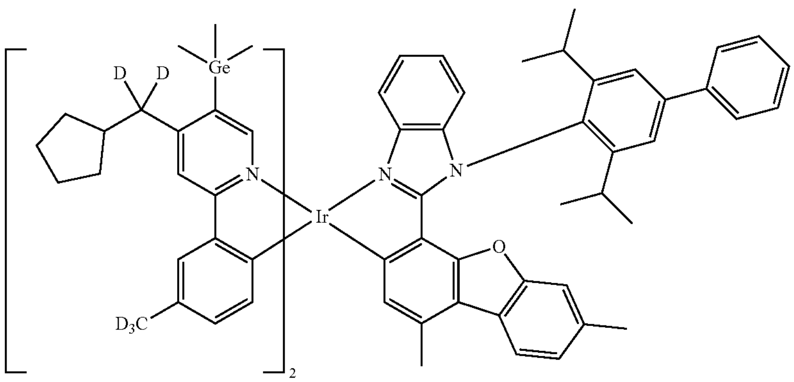
1675
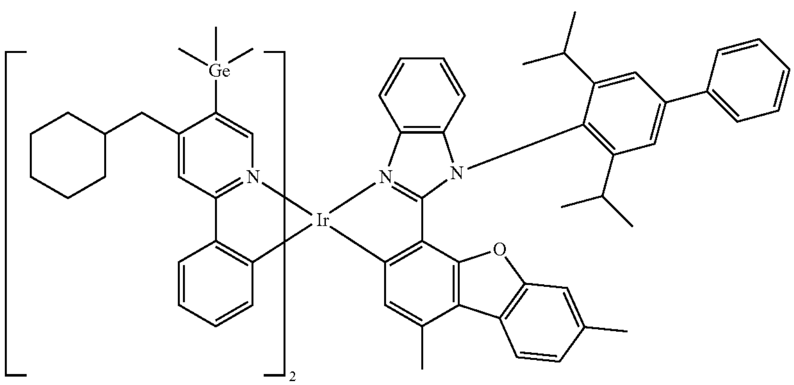
1676
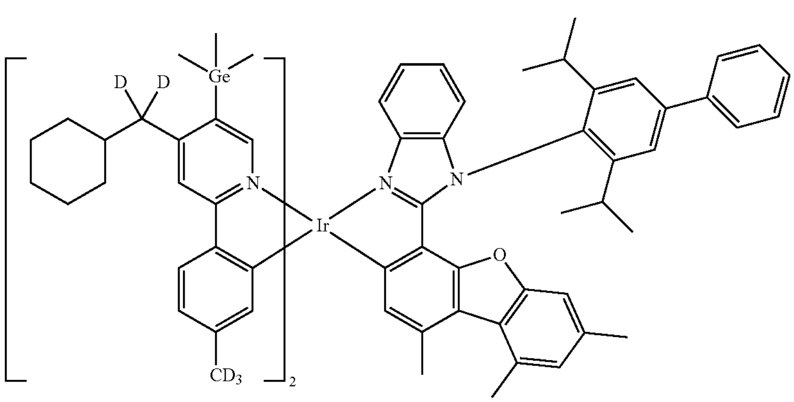

-continued
1677
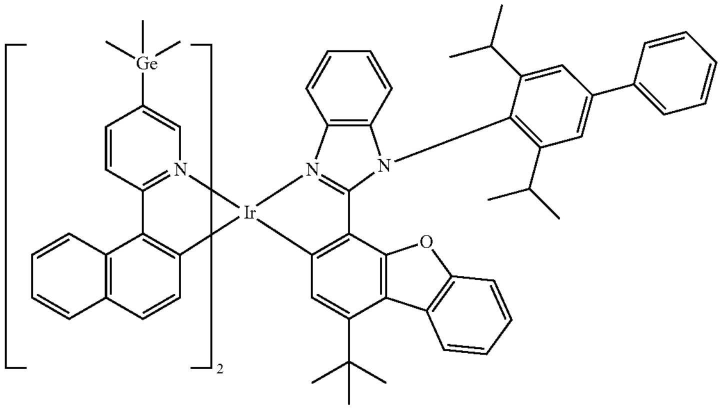
1678
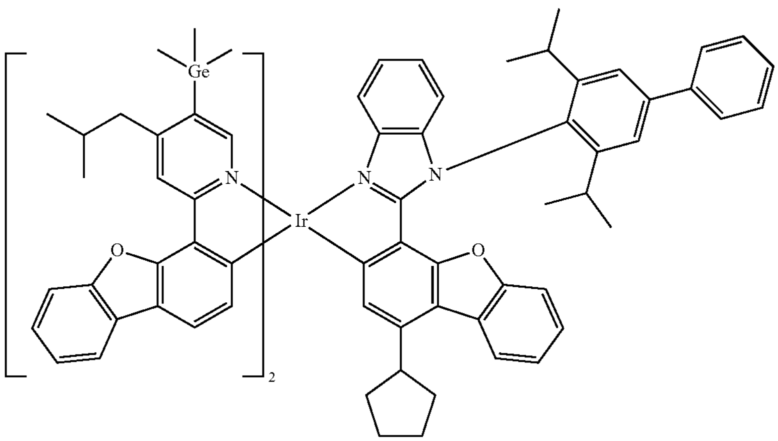
1679
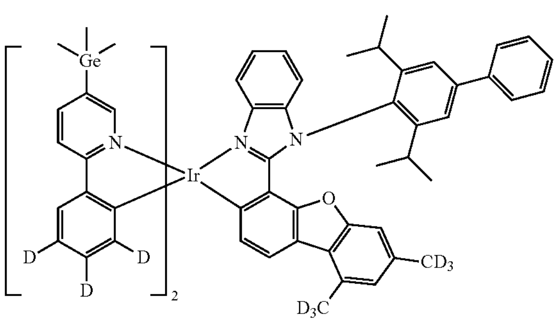
1680
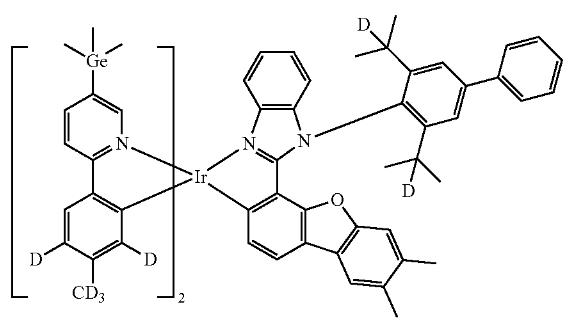
1681
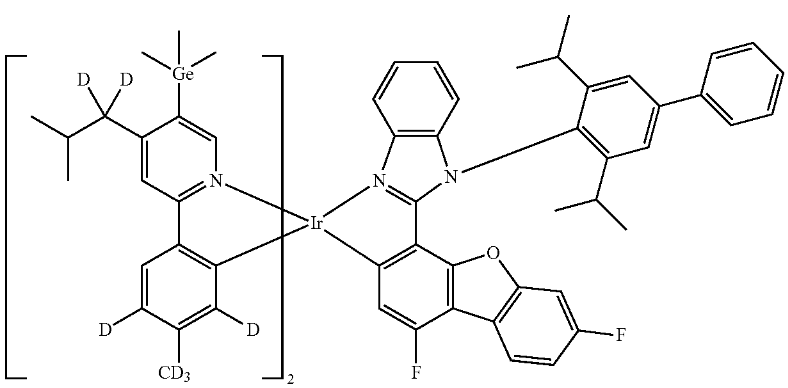

-continued
1682
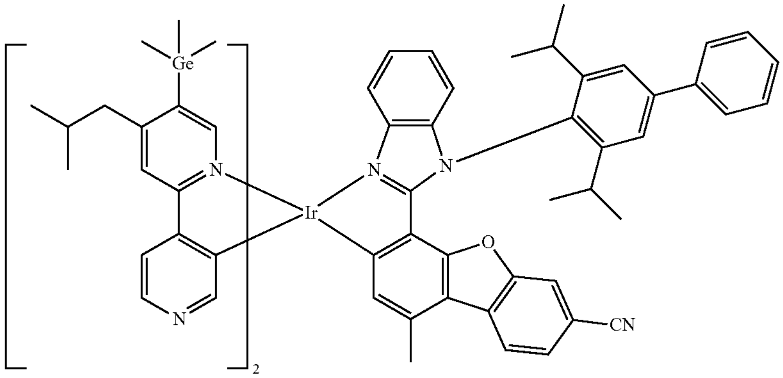
1683
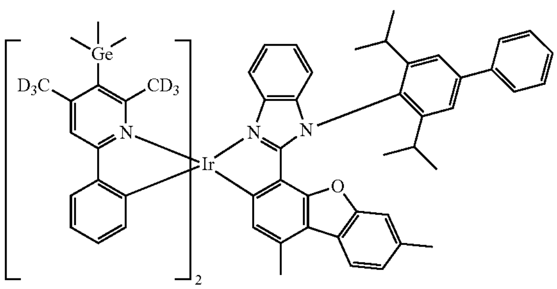
1684
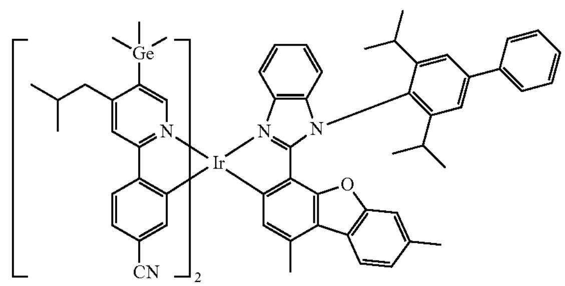
1685
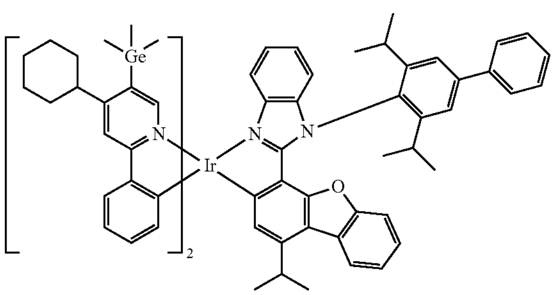
1686
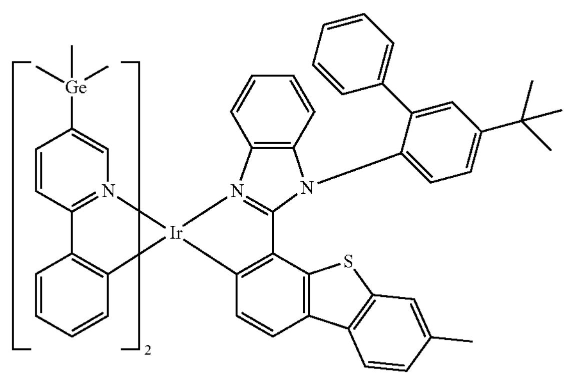
1687
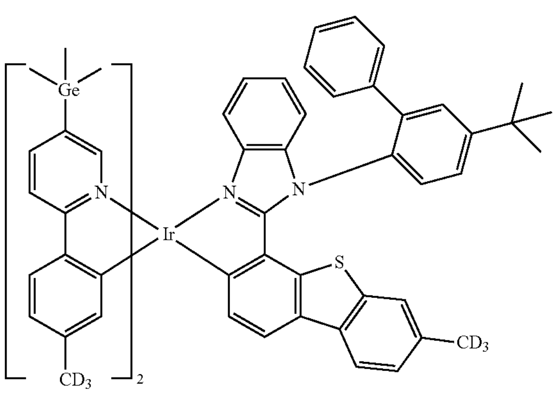
1688
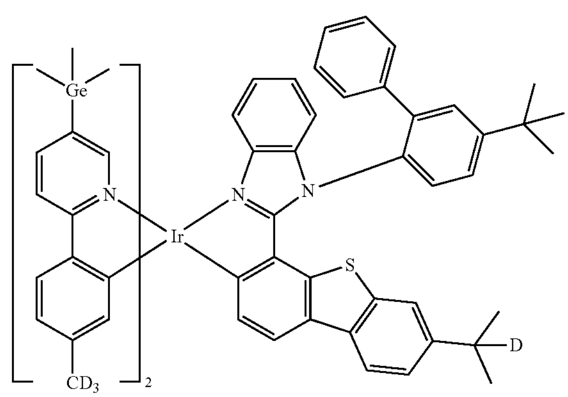

-continued
1689
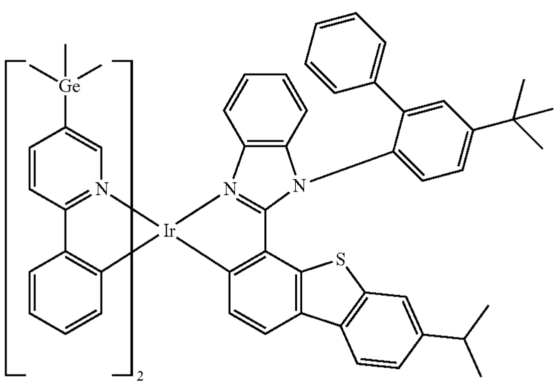
1690
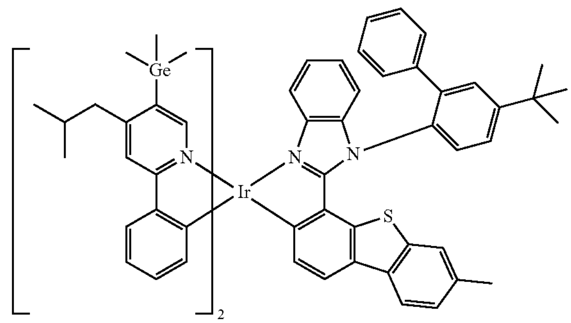
1691
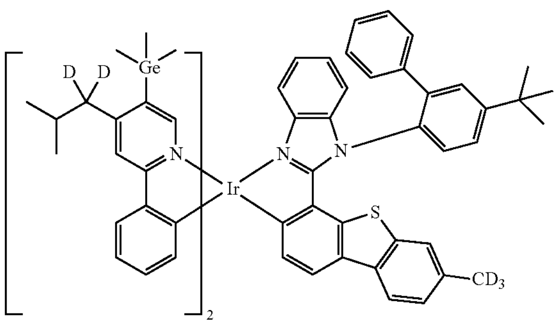
1692
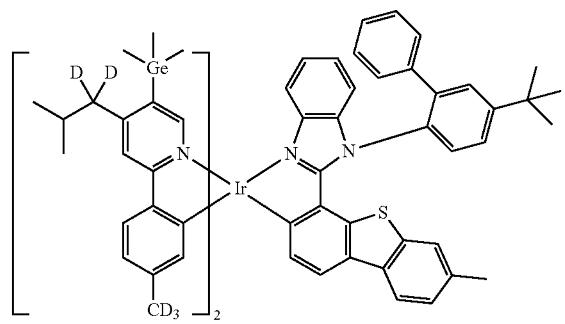
1693
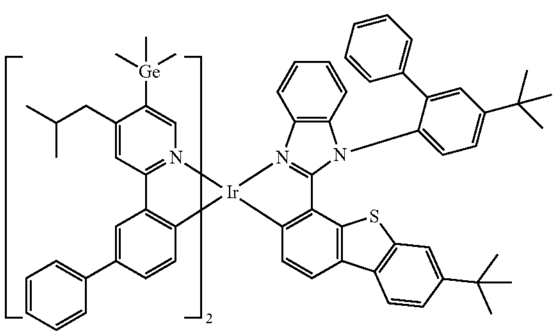
1694
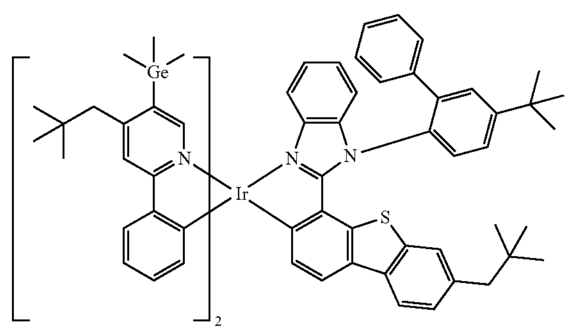
1695
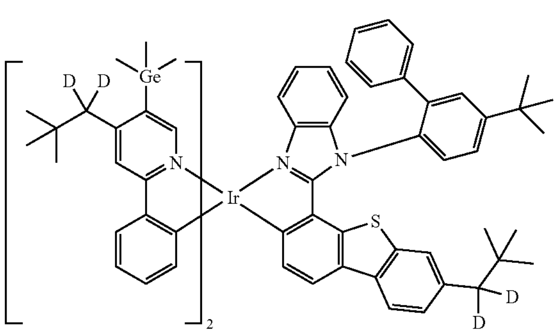
1696
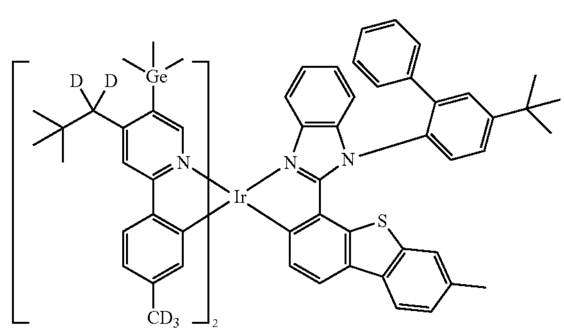

-continued
1697
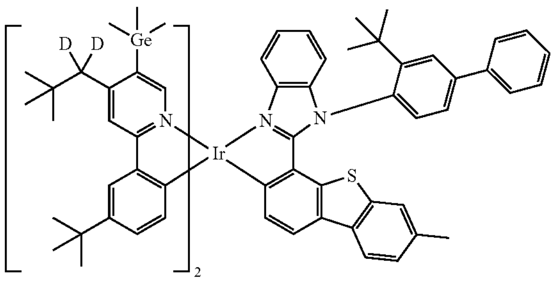
1698
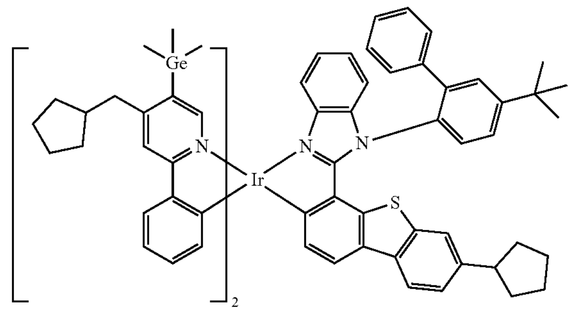
1699
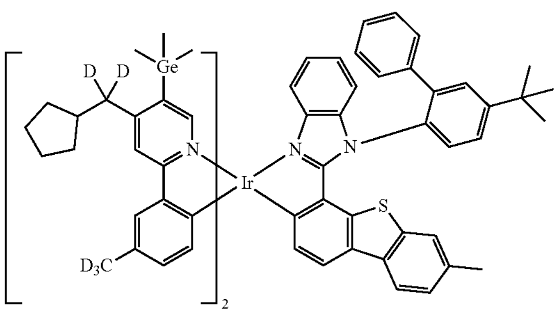
1700
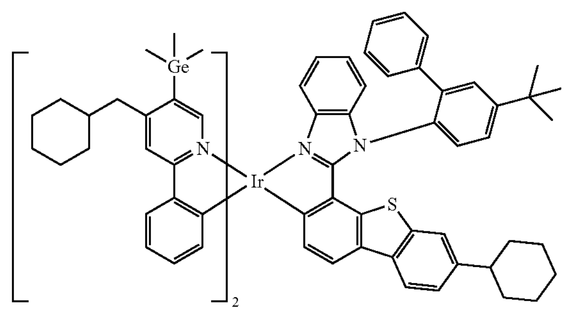
1701
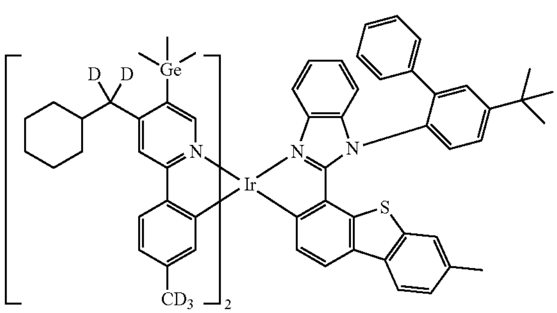
1702
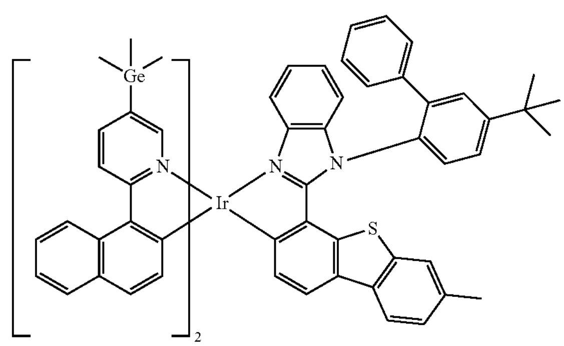
1703
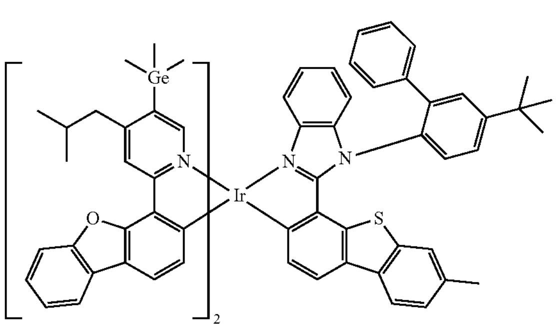
1704
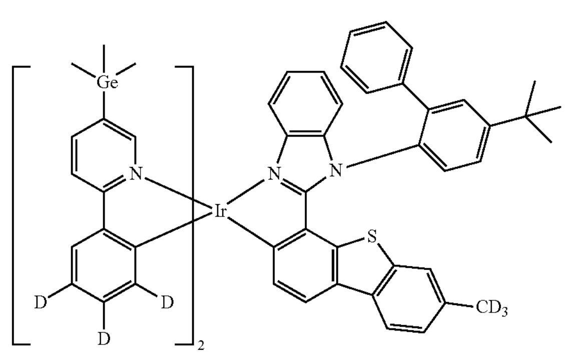

-continued
1705
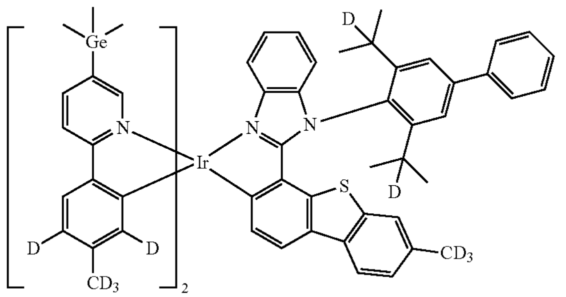
1706
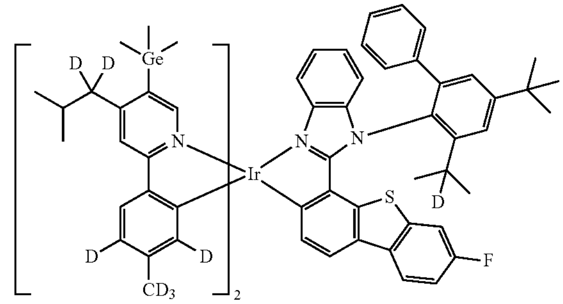
1707
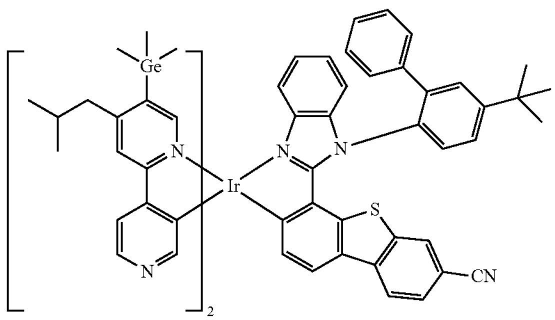
1708
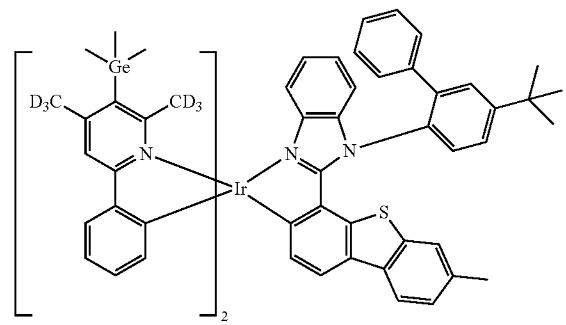
1709
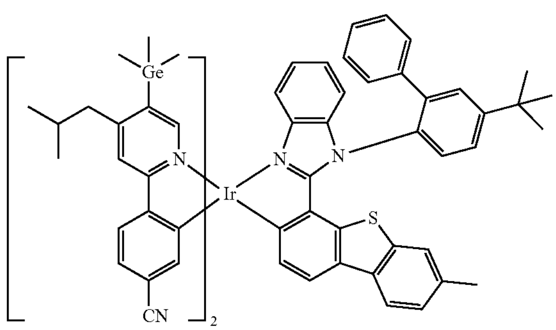
1710
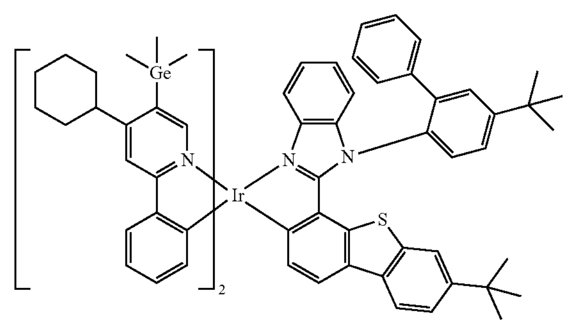
1711
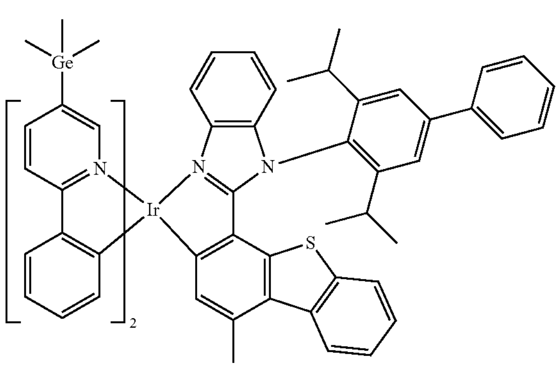
-continued
1712
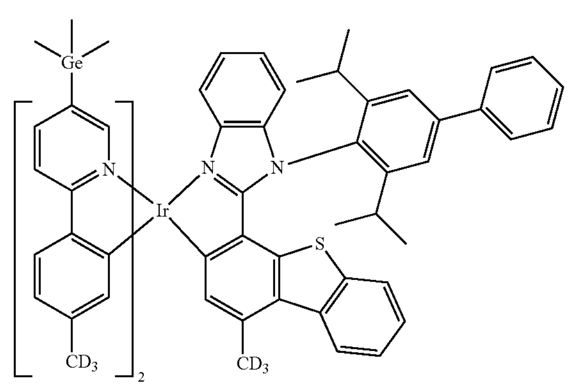

-continued
1713
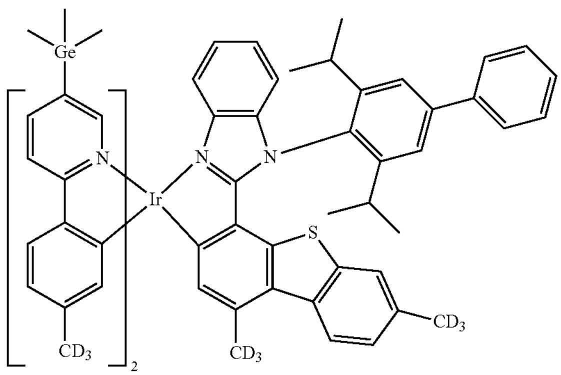
1714
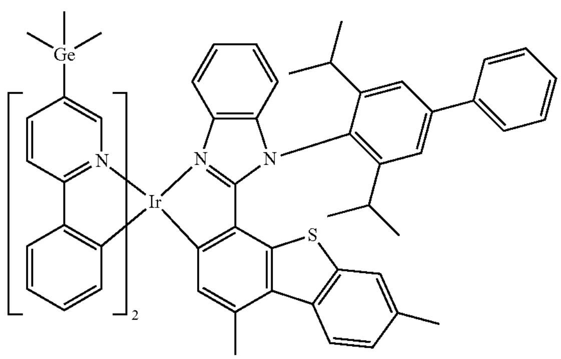
1715
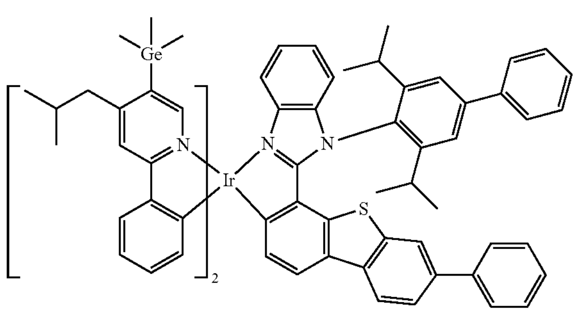
1716
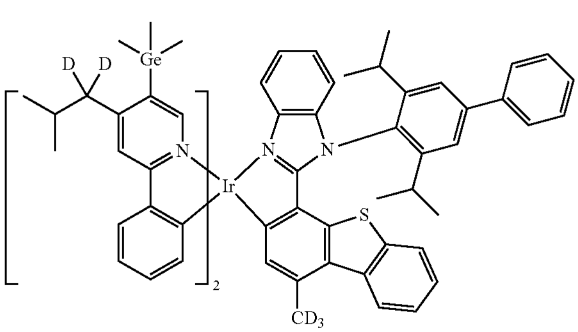
-continued
1717
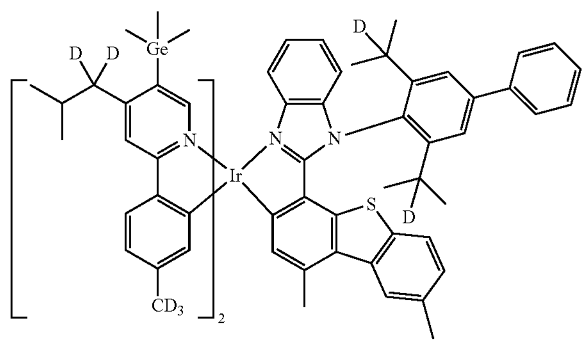
1718
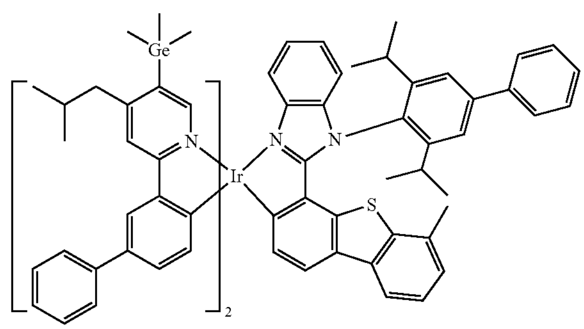
1719
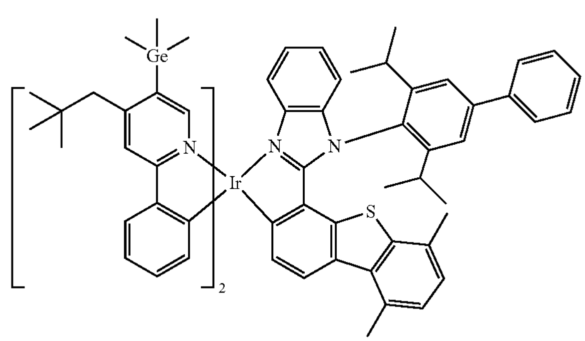
1720
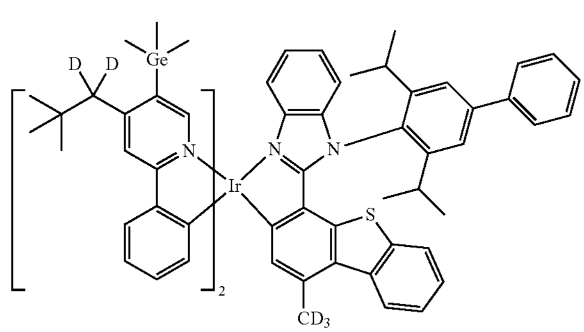

-continued
1721
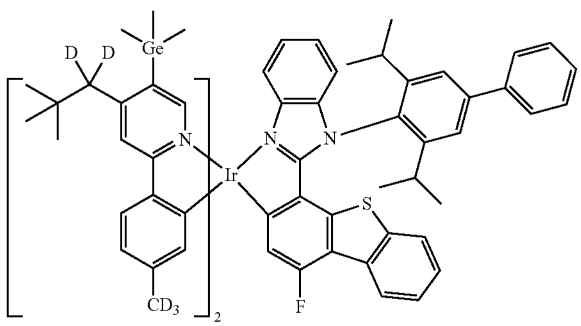
1722
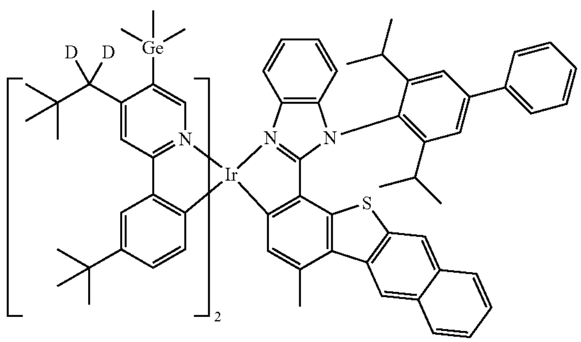
1723
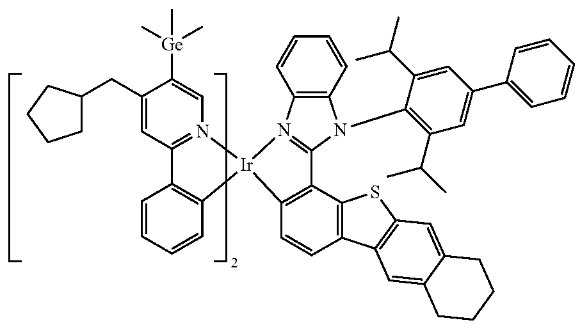
1724
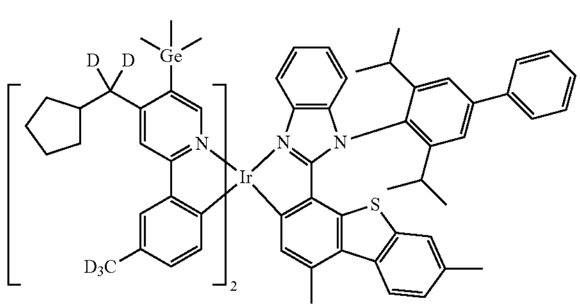
-continued
1725
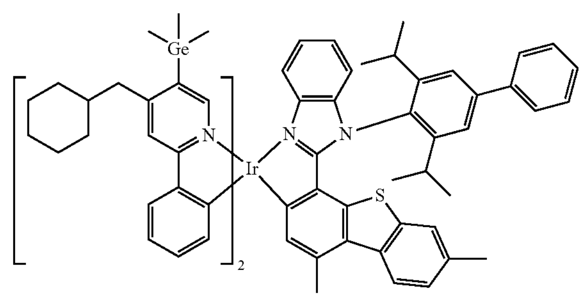
1726
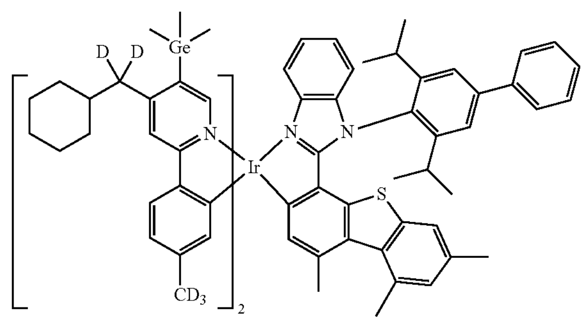
1727
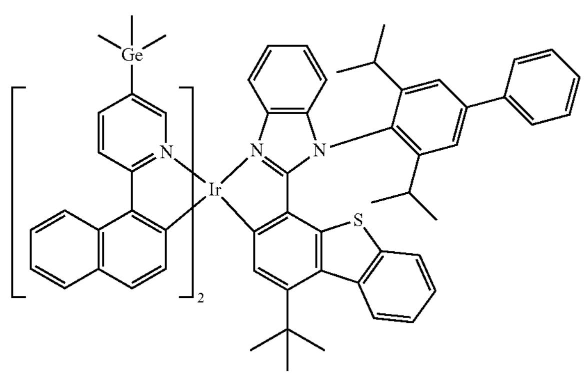
1728
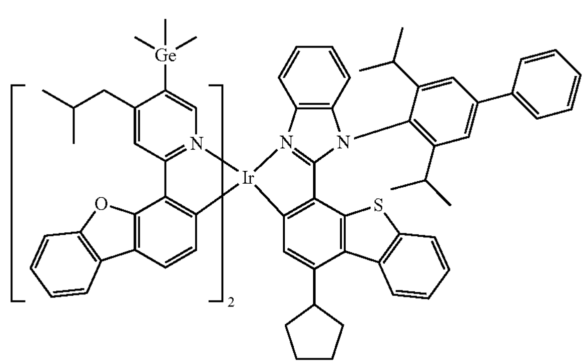

-continued
1729
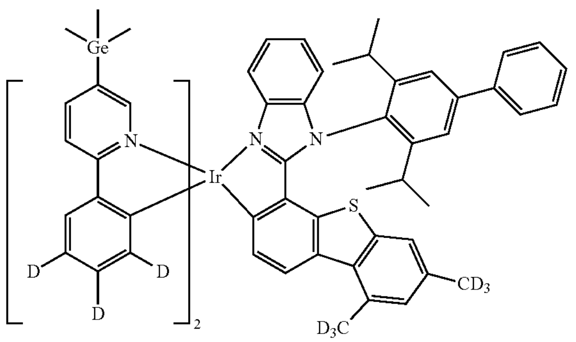
1730
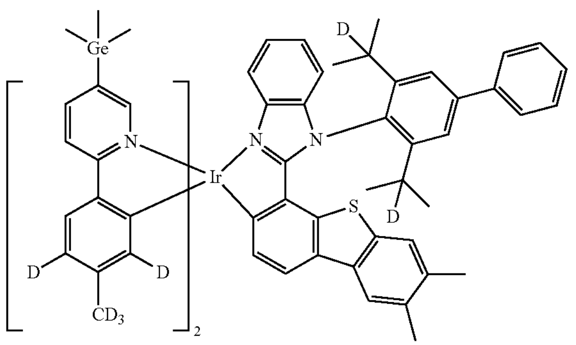
1731
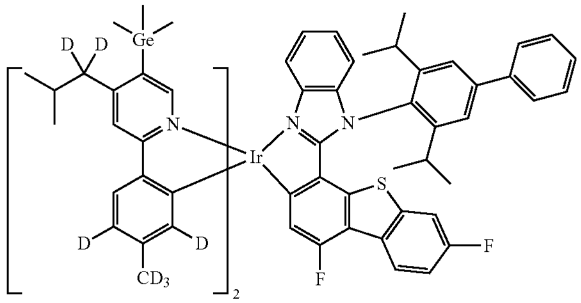
1732
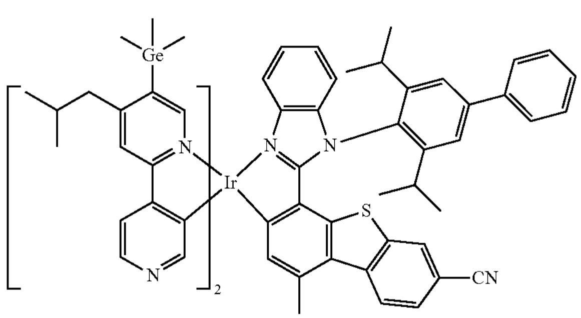
-continued
1733
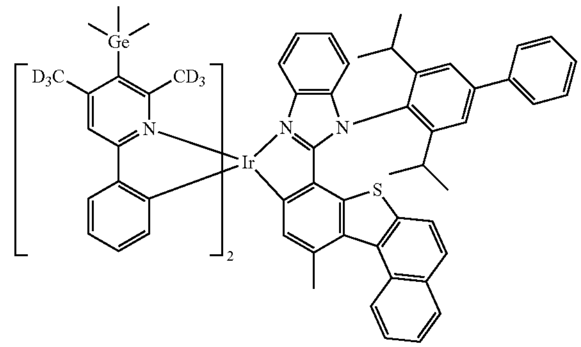
1734
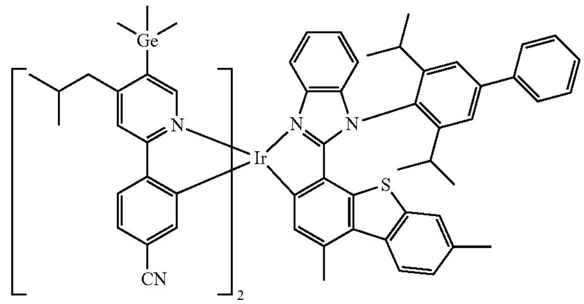
1735
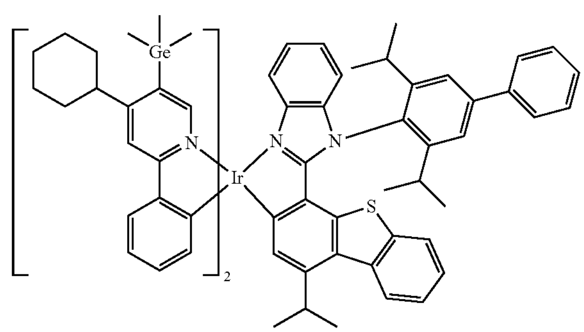
1736
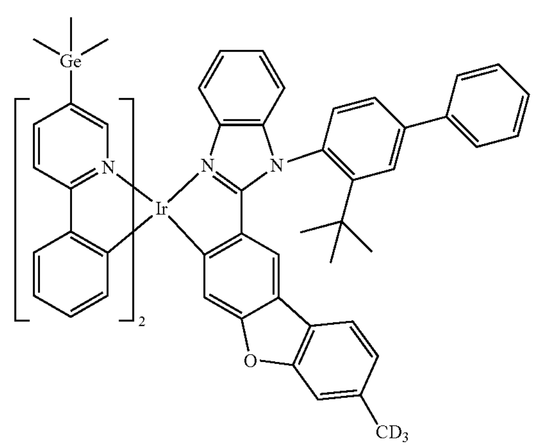

-continued
1737
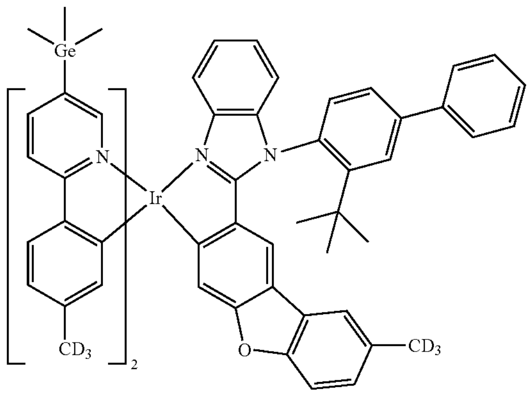
1738
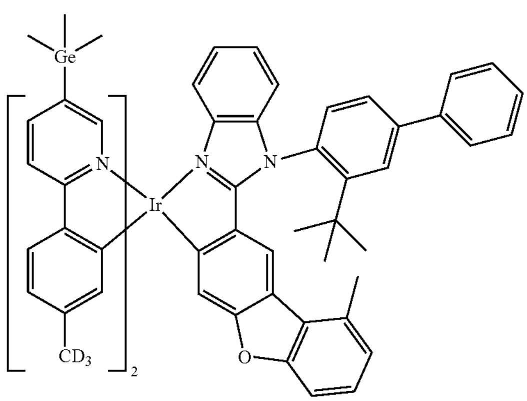
1739
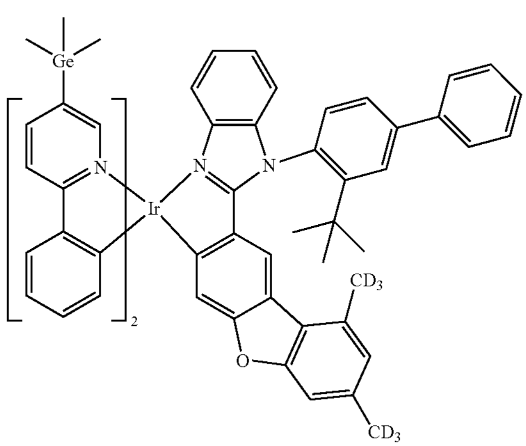
-continued
1740
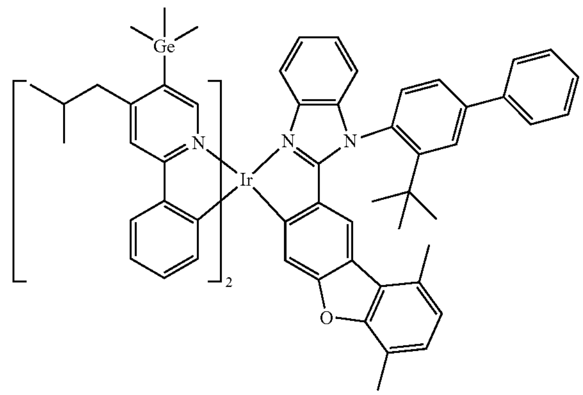
1741
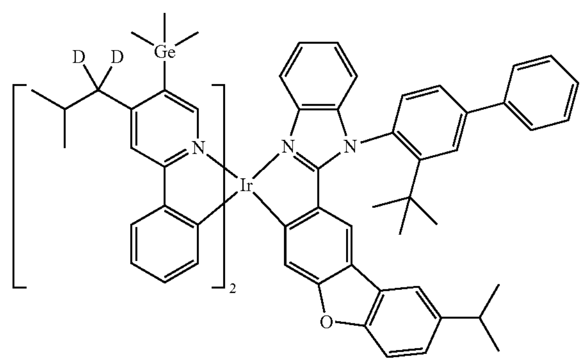
1742
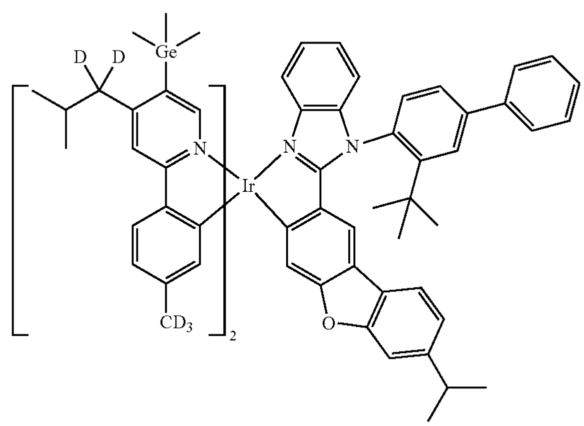
1743
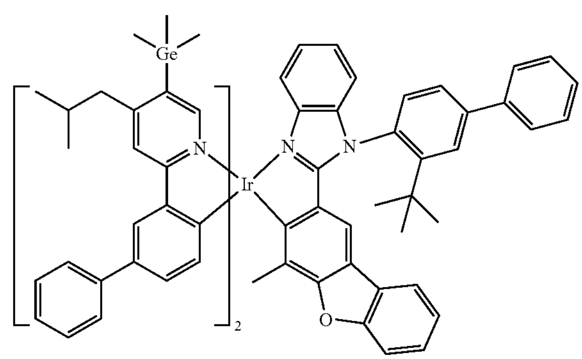

-continued
1744
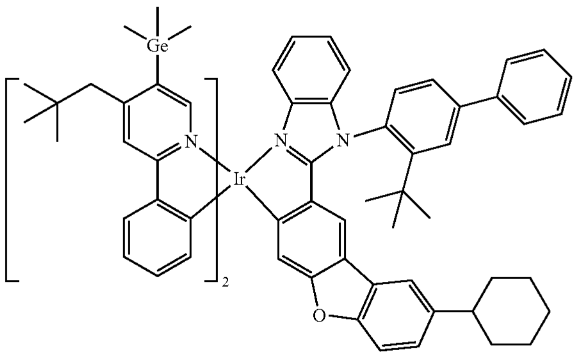
1745
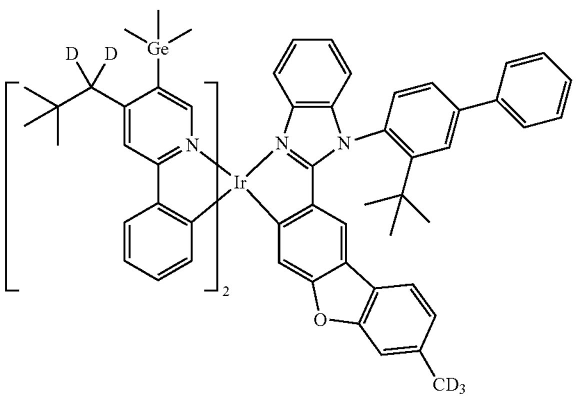
1746
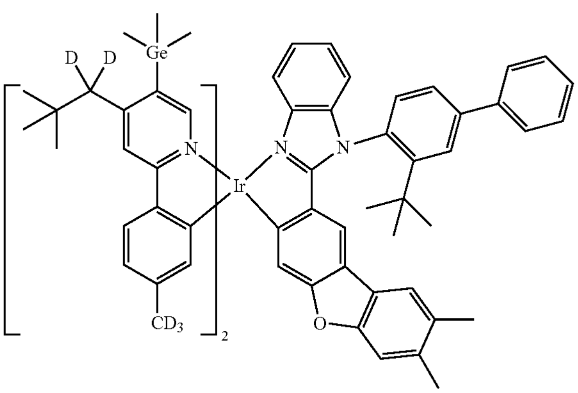
1747
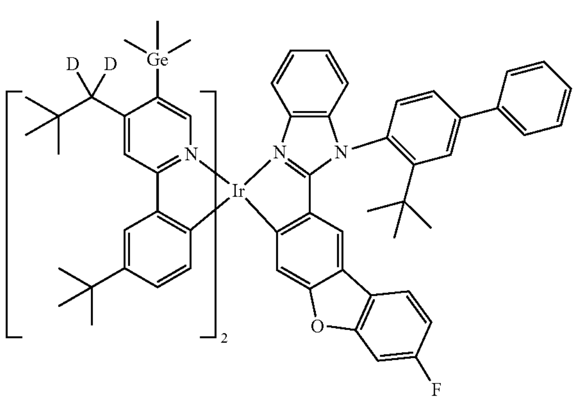
-continued
1748
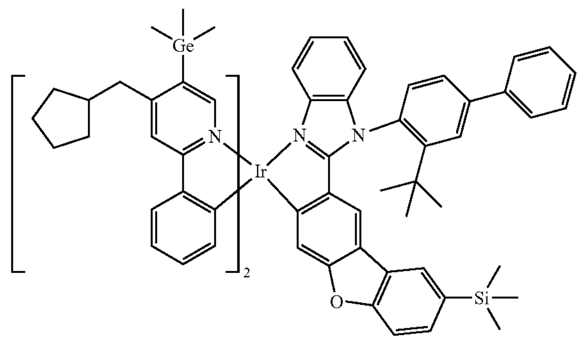
1749
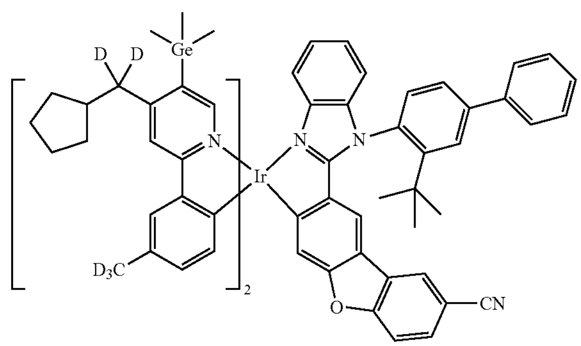
1750
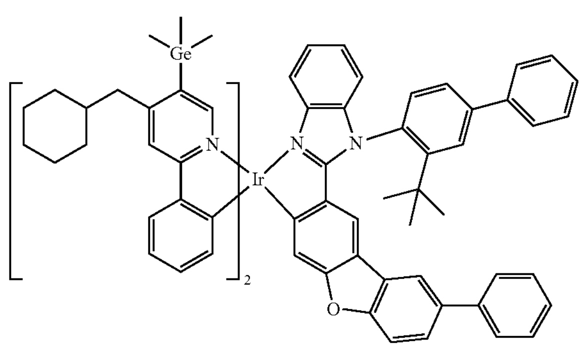
1751
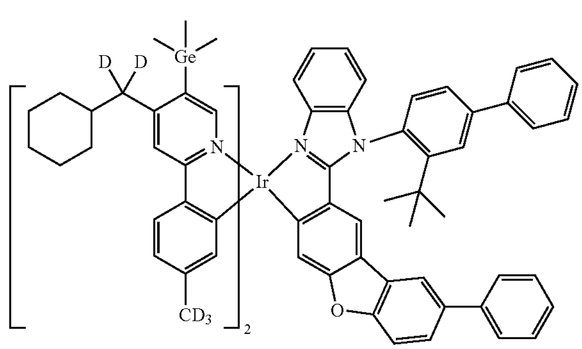

-continued
1752
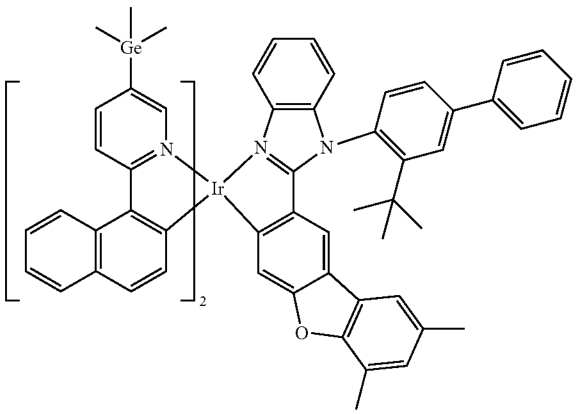
1753
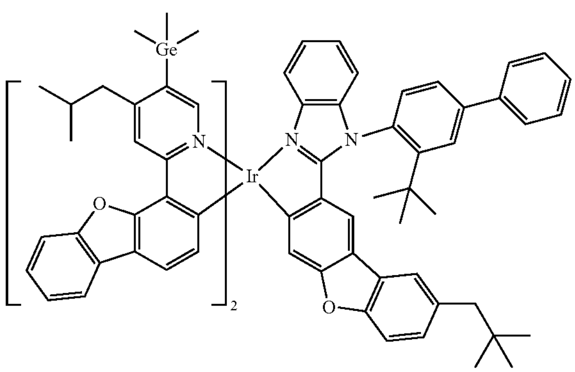
1754
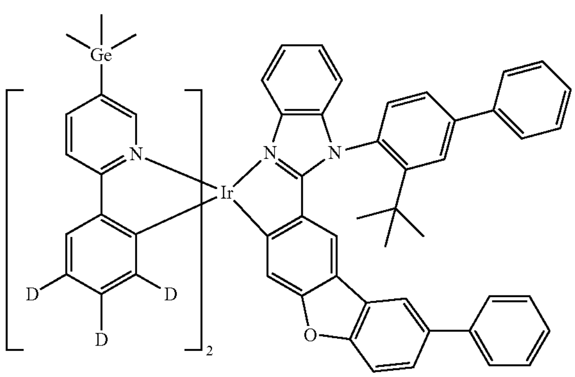
1755
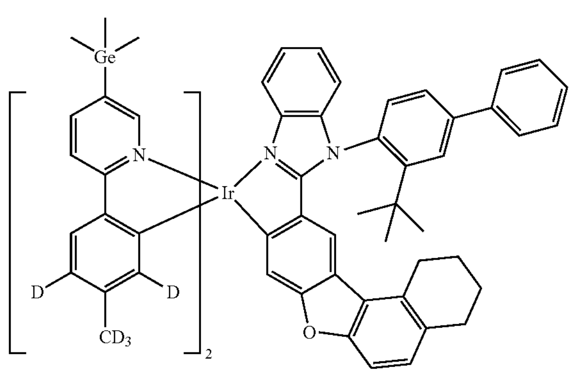
-continued
1756
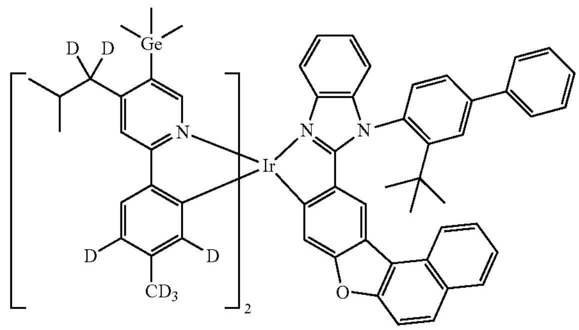
1757
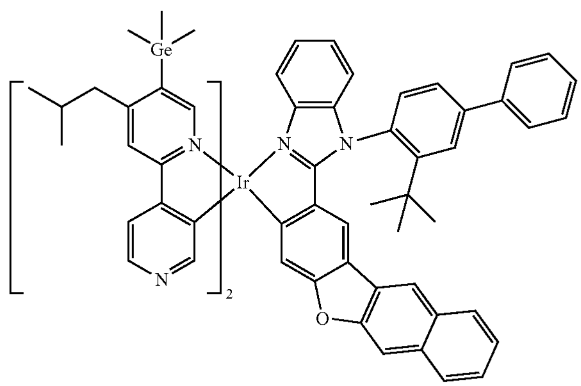
1758
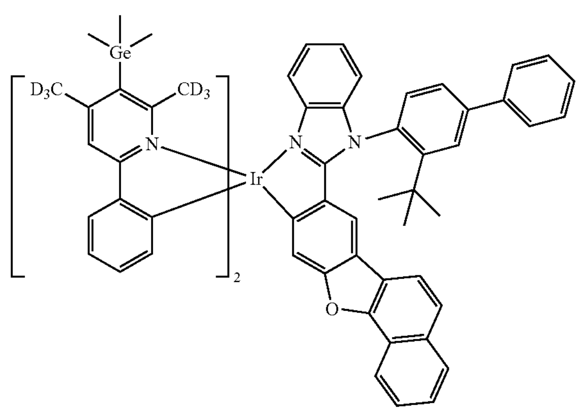
1759
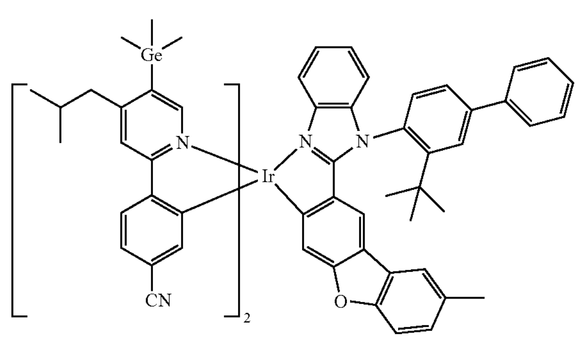

1760
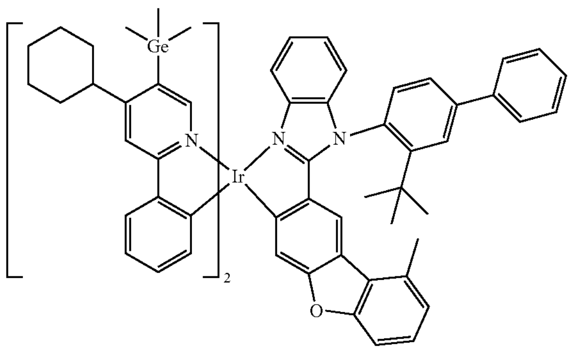
1761
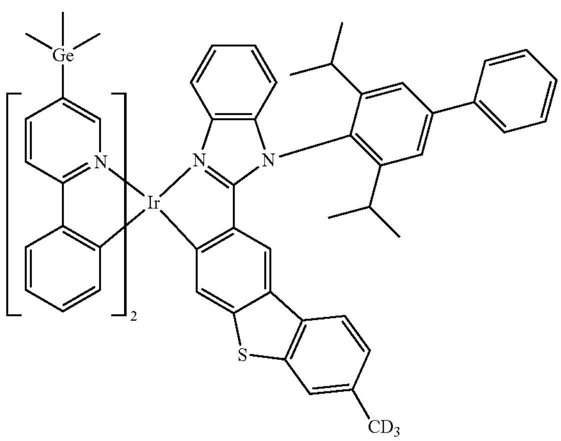
1762
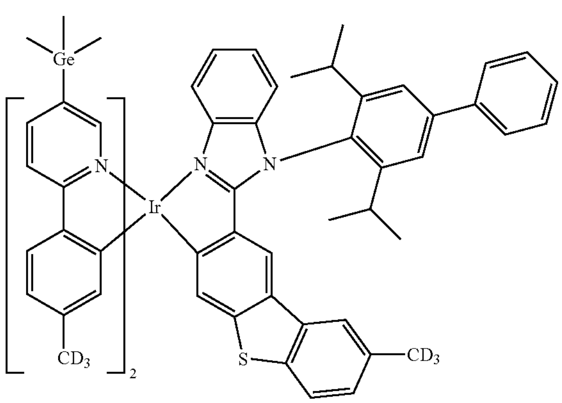
1763
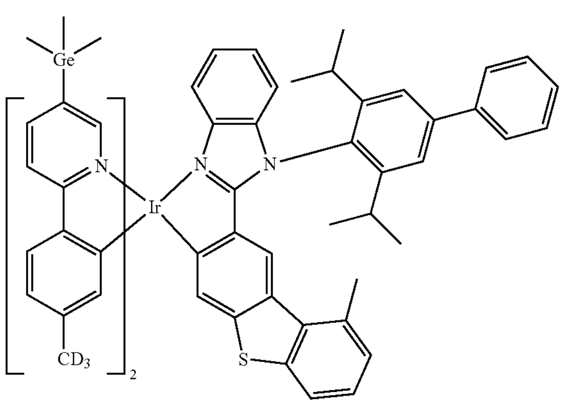
1764
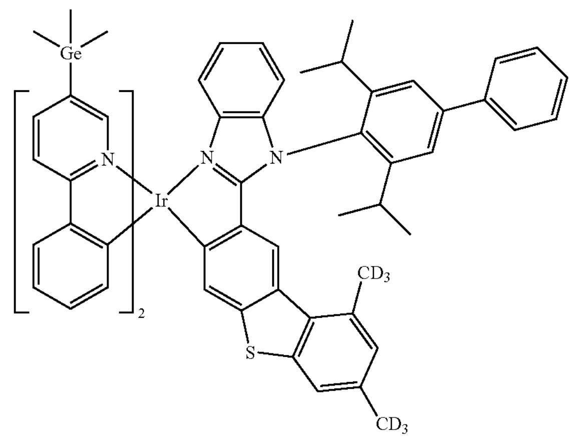
1765
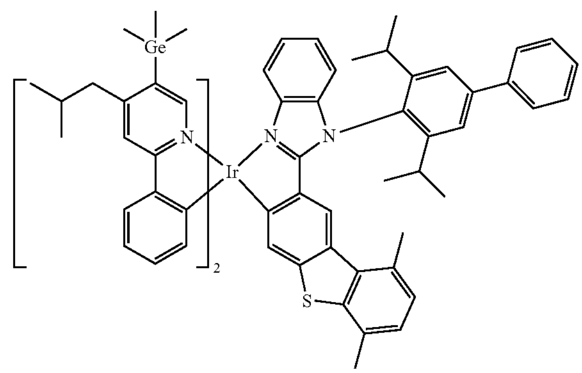
1766
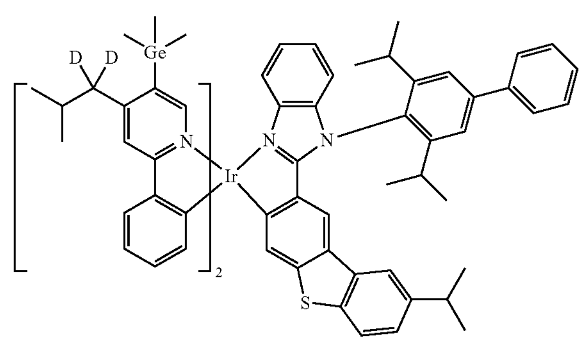
1767
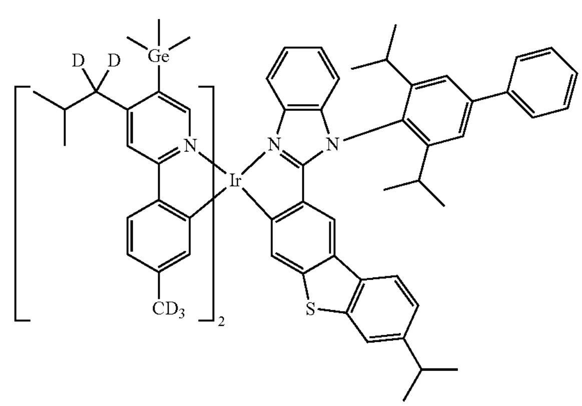

-continued
1768
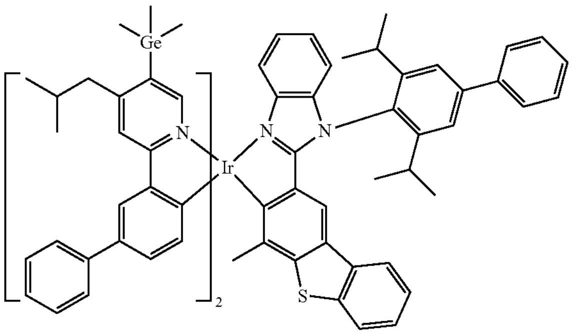
1769
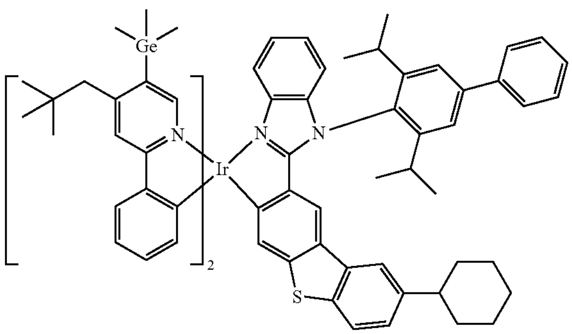
1770
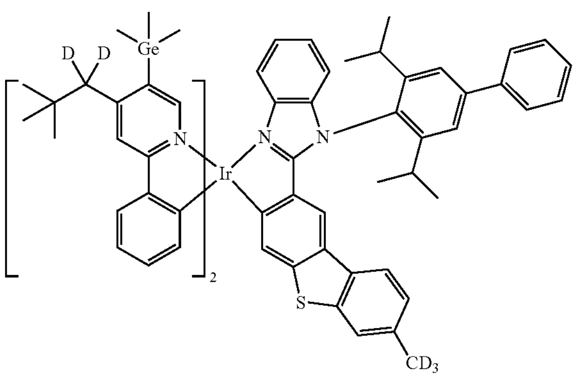
1771
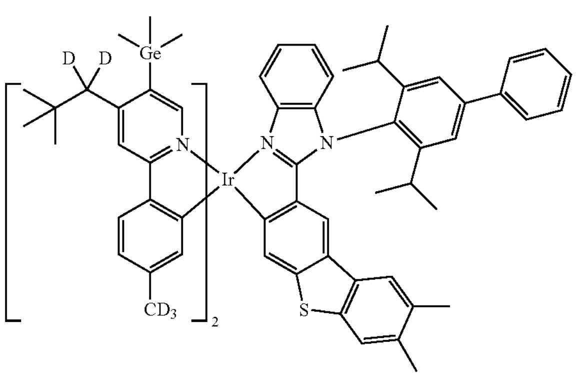
-continued
1772
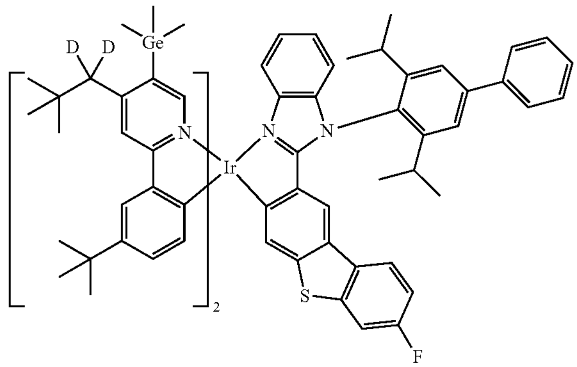
1773
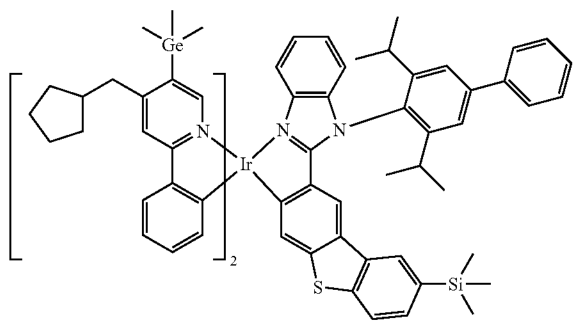
1774
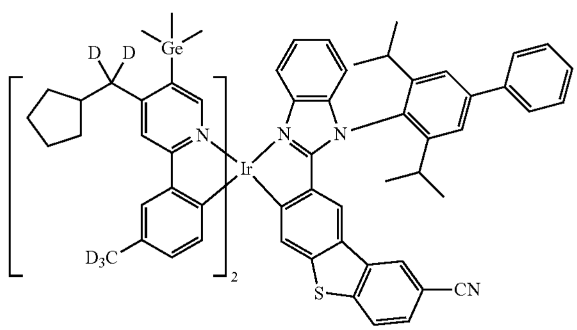
1775
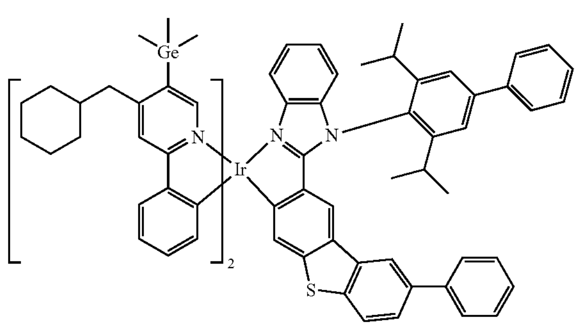

-continued
1776
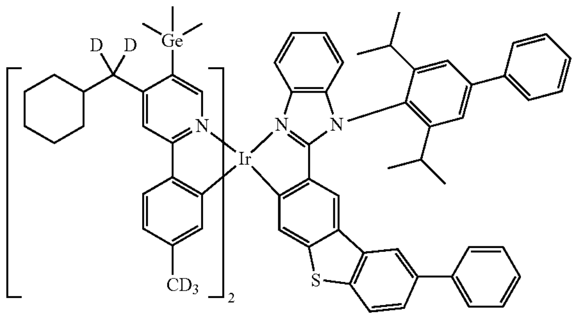
1777
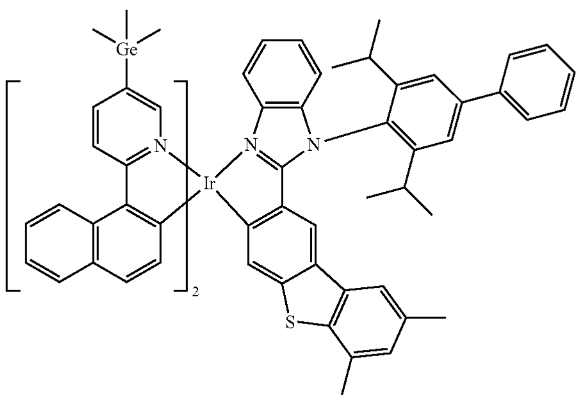
1778
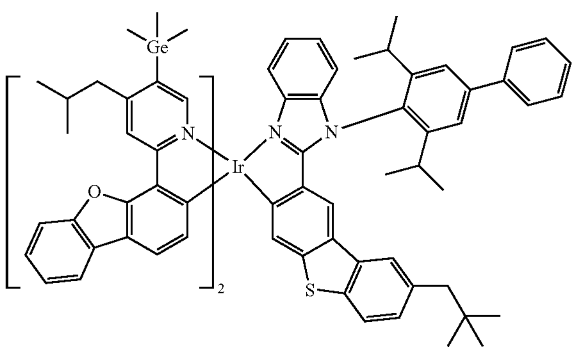
1779
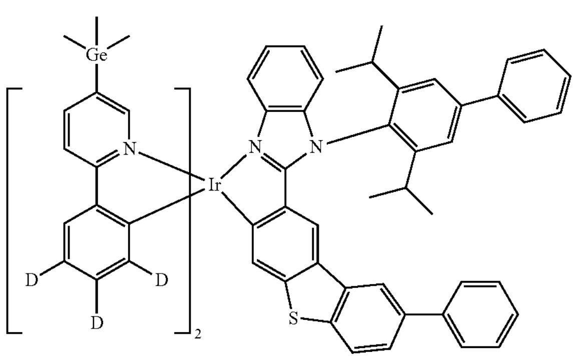
-continued
1780
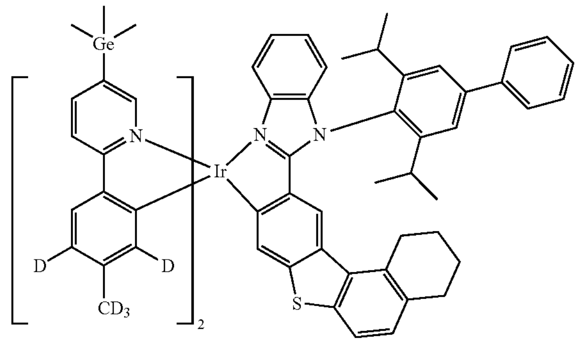
1781
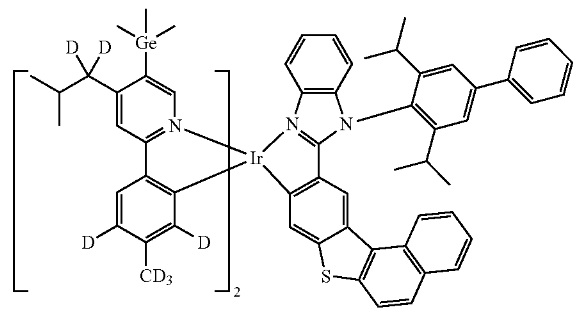
1782
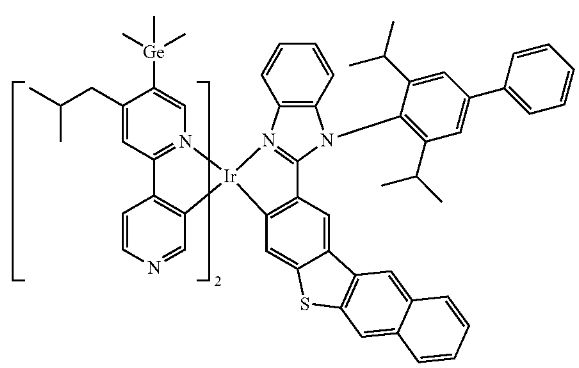
1783
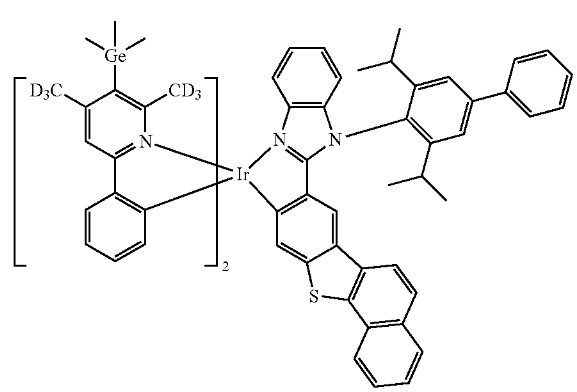

-continued
1784
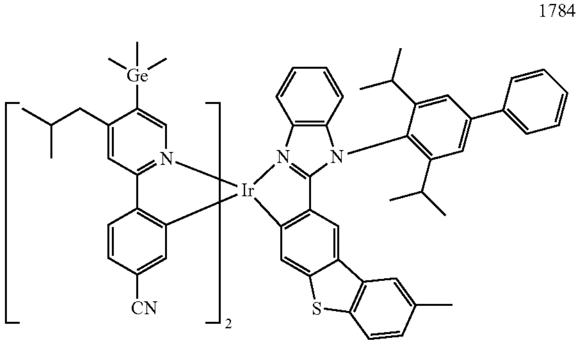
1785
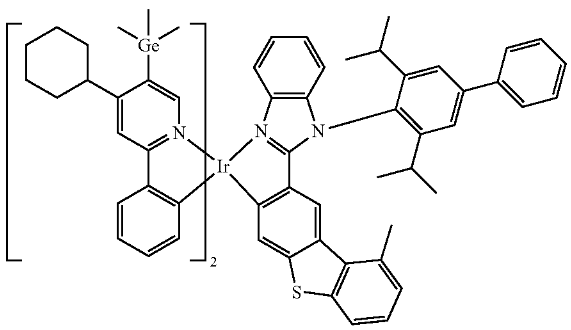
1786
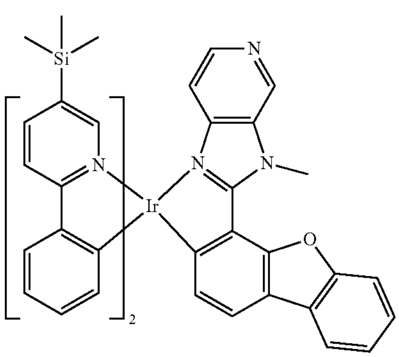
1787
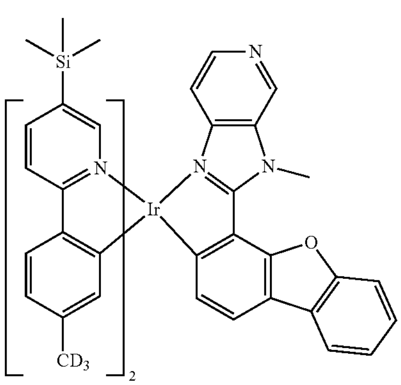
-continued
1788
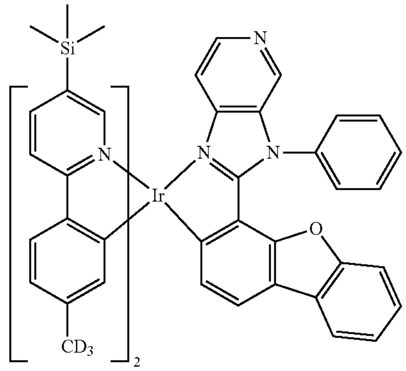
1789
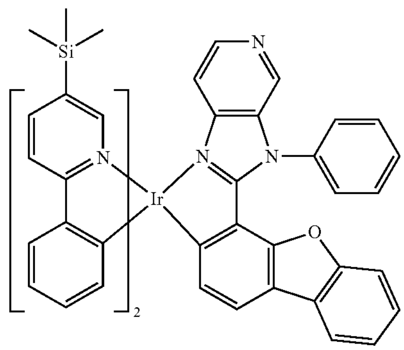
1790
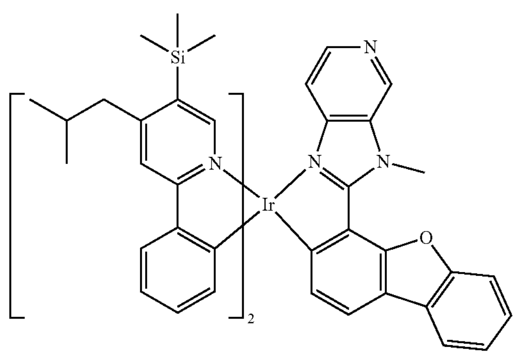
1791
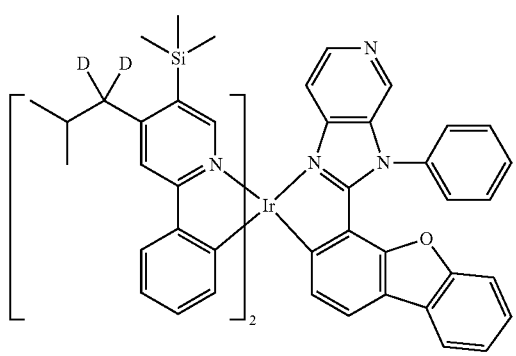

-continued
1792
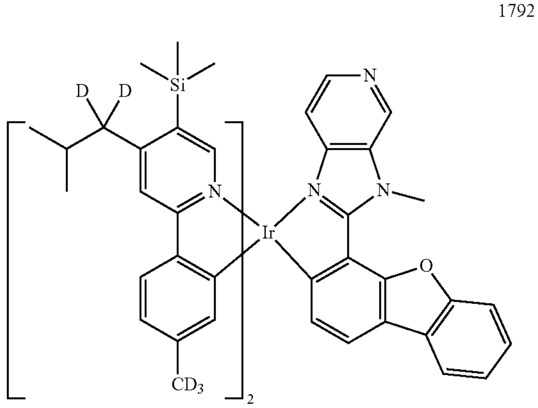
1793
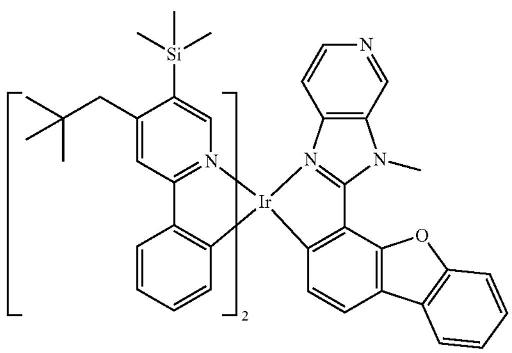
1794
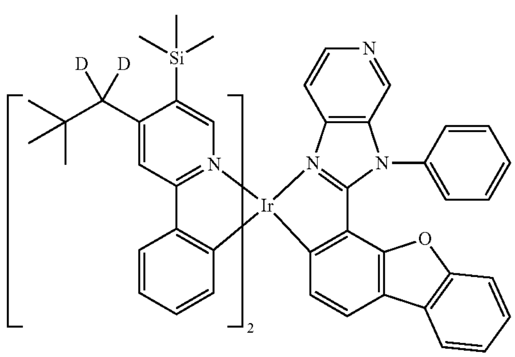
1795
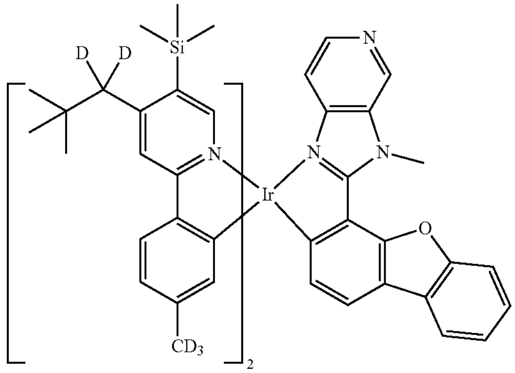
-continued
1796
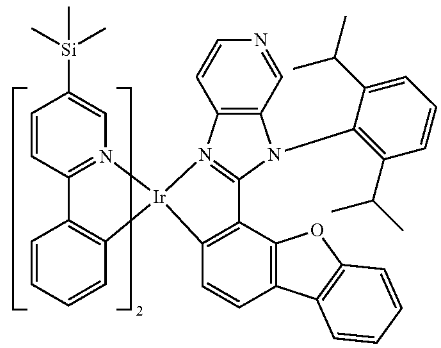
1797
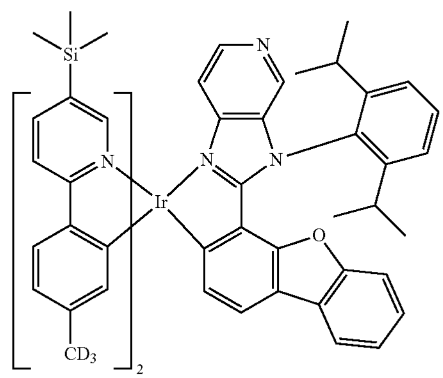
1798
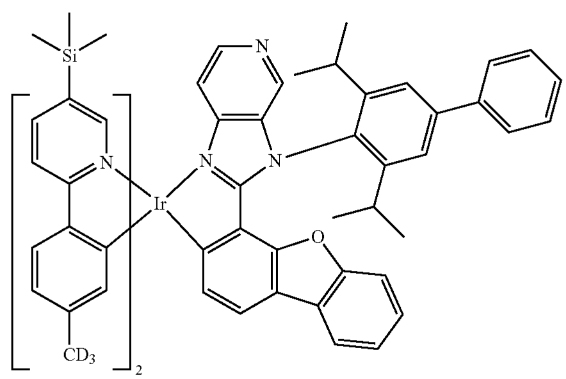
1799
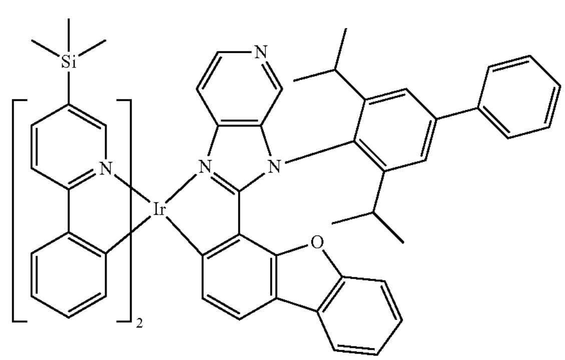

-continued
1800
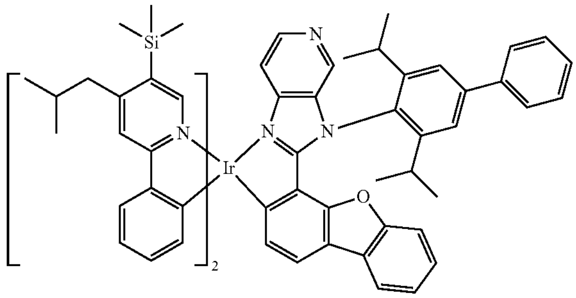
1801
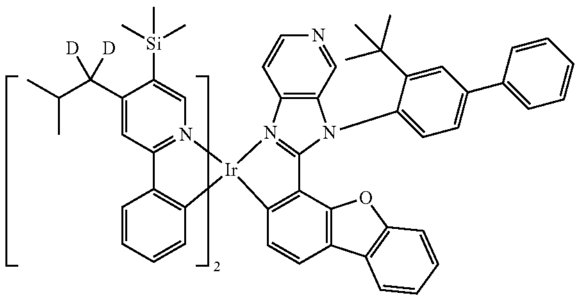
1802
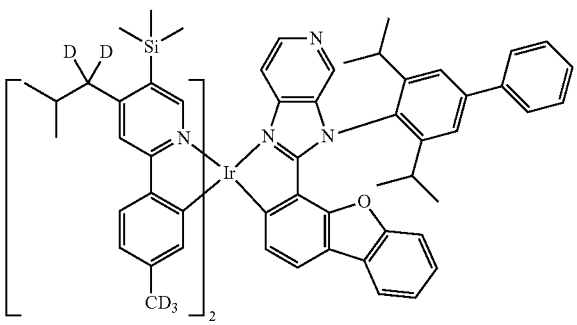
1803
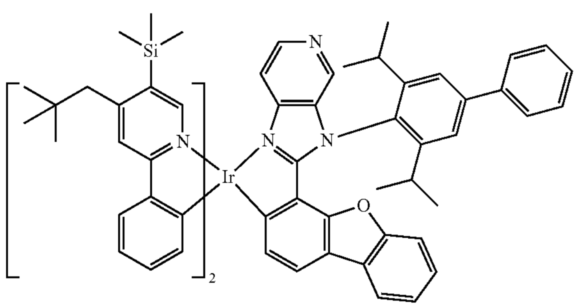
1804
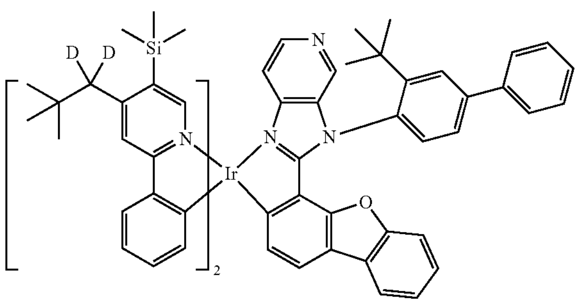
-continued
1805
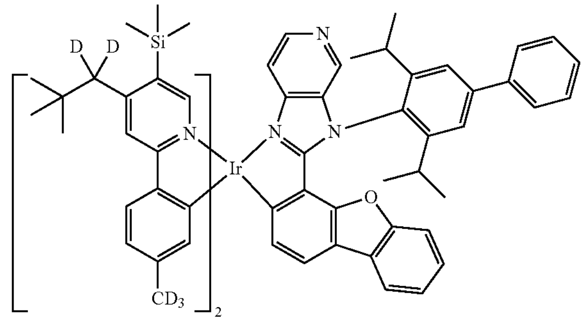
1806
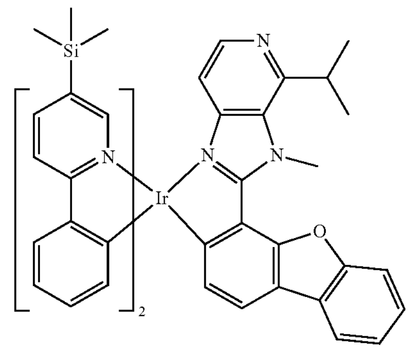
1807
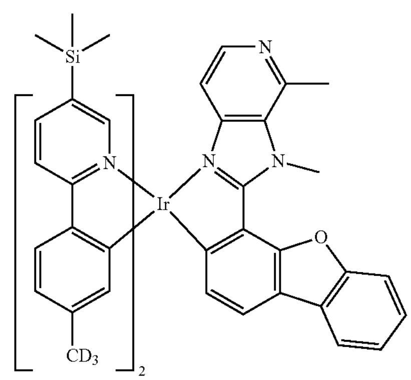
1808
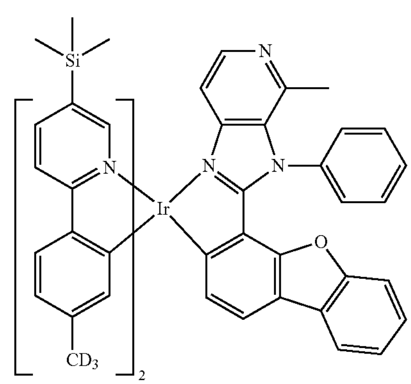

-continued
1809
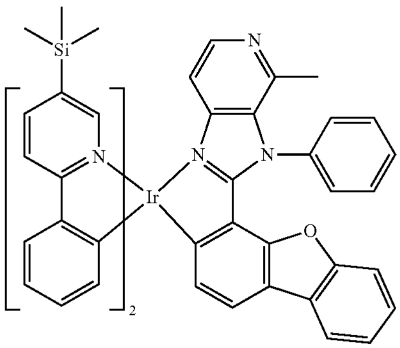
1810
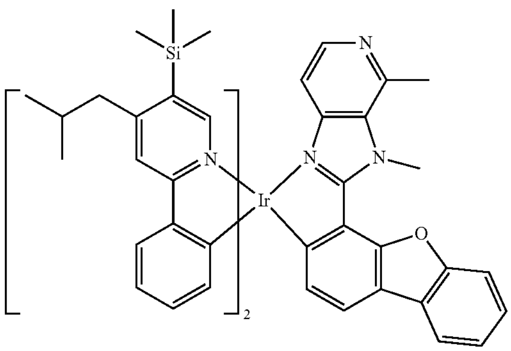
1811
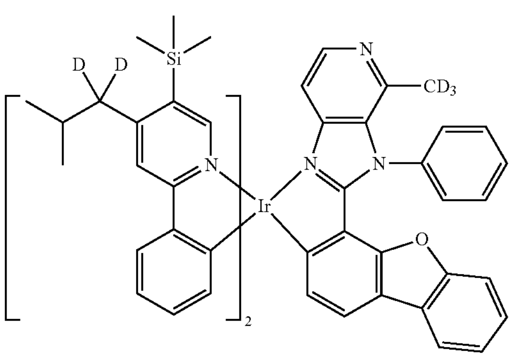
1812
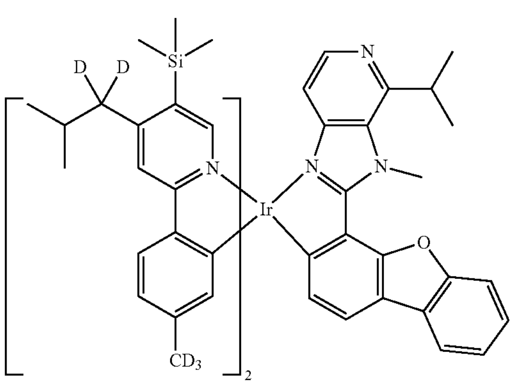
-continued
1813
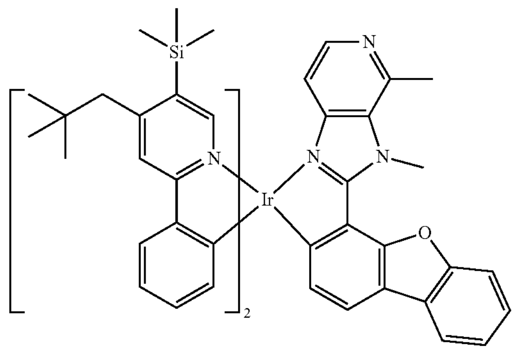
1814
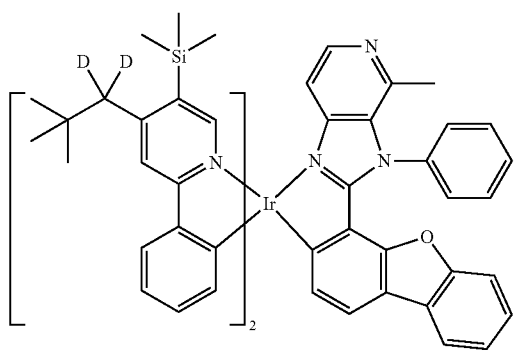
1815
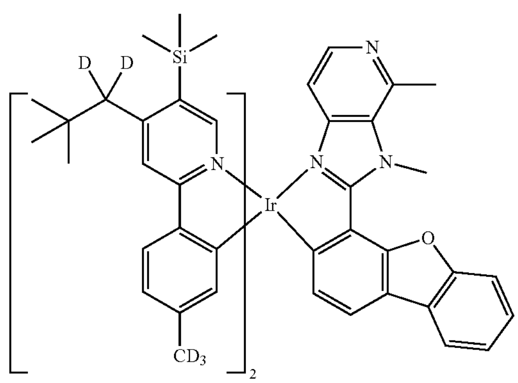
1816
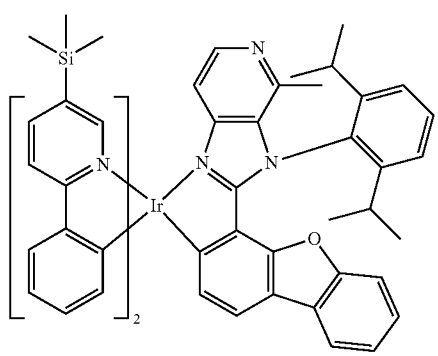

-continued
1817
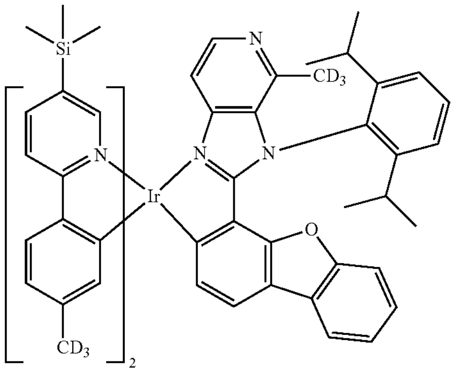
1818
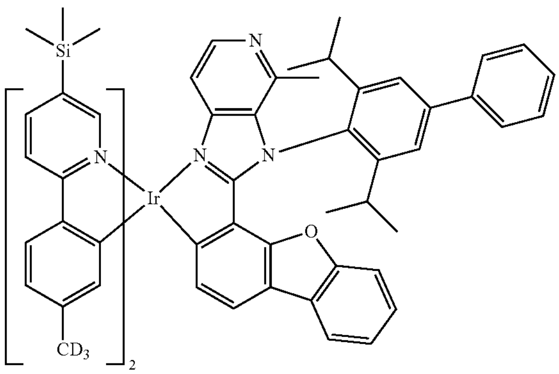
1819
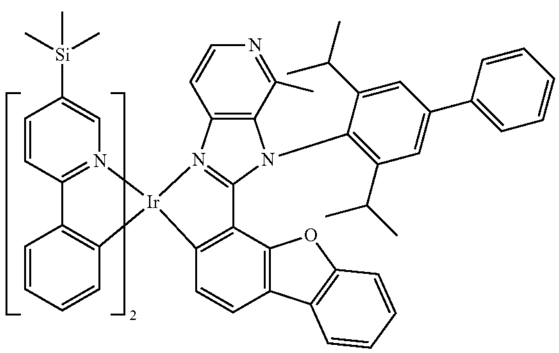
1820
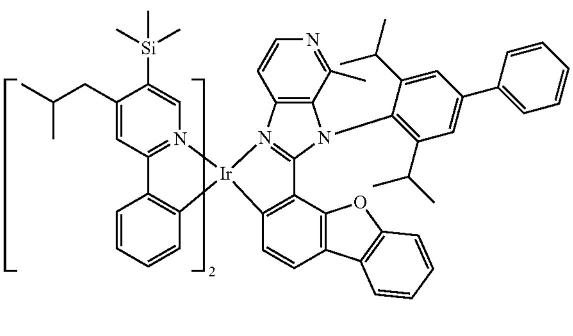
-continued
1821
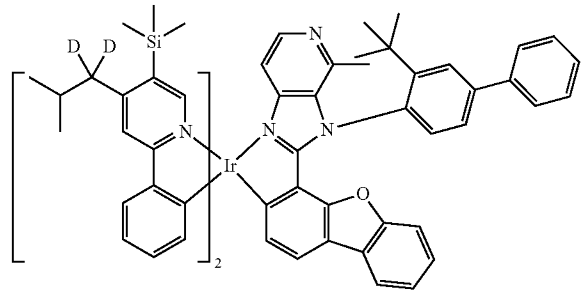
1822
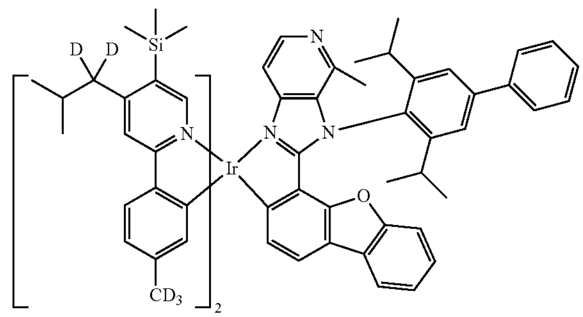
1823
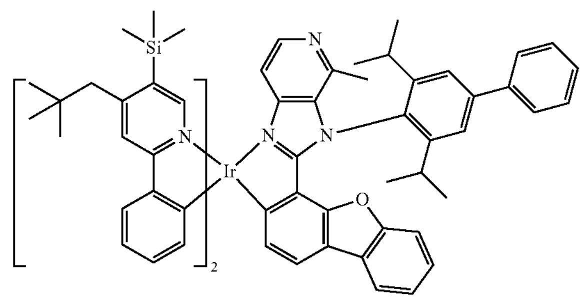
1824
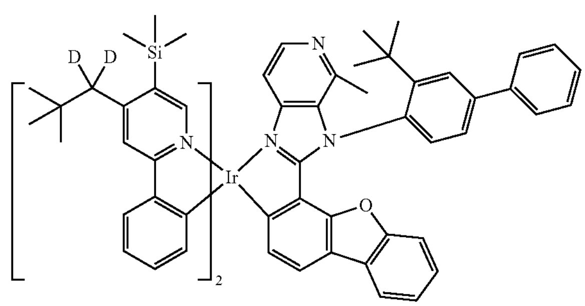
1825
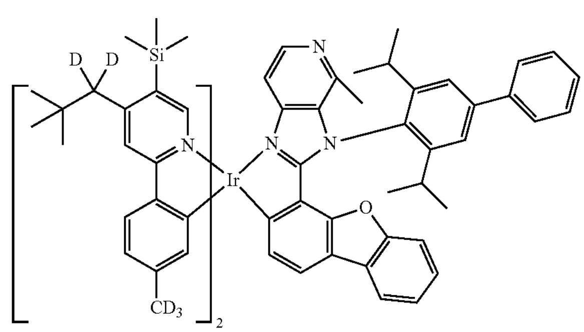

1826
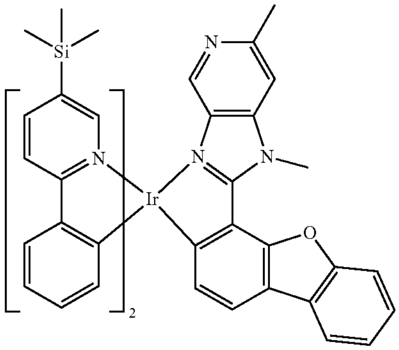
1827
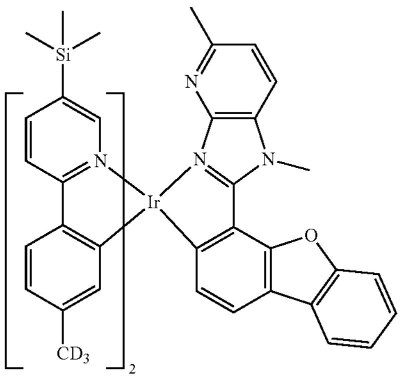
1828
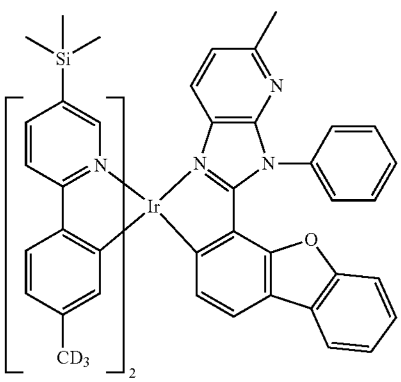
1829
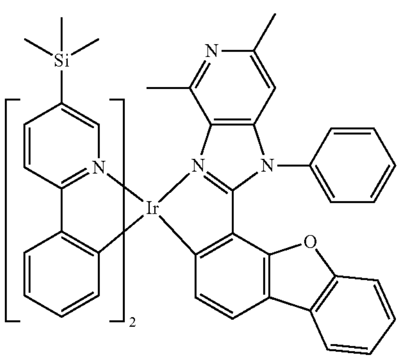
1830
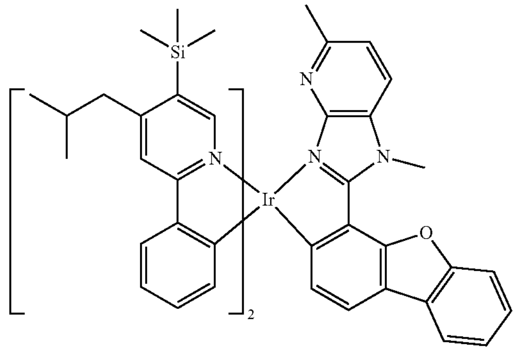
1831
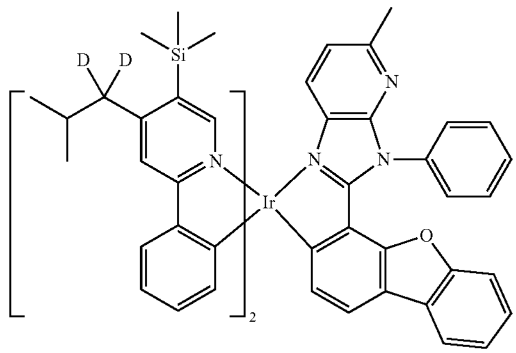
1832
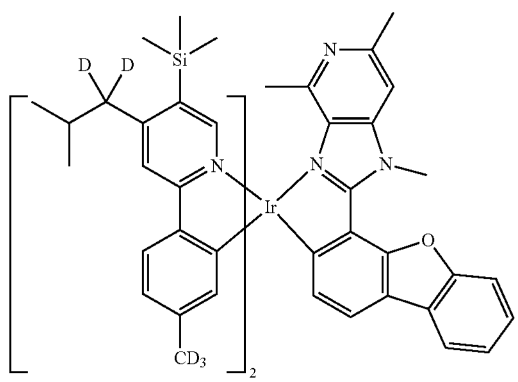
1833
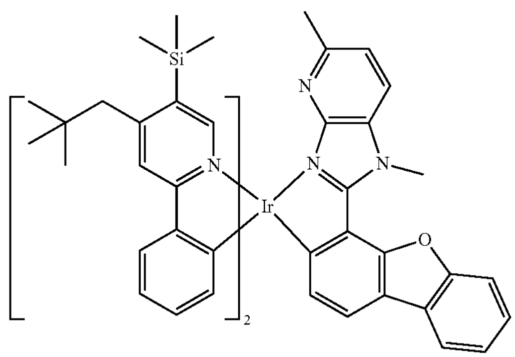

-continued
1834
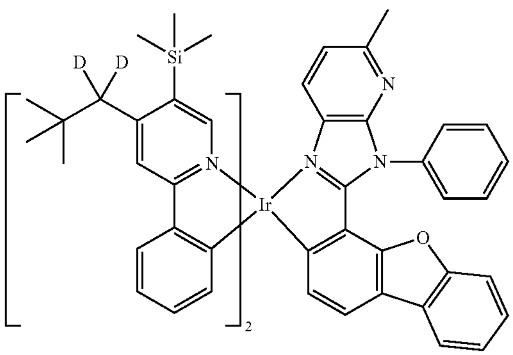
1835
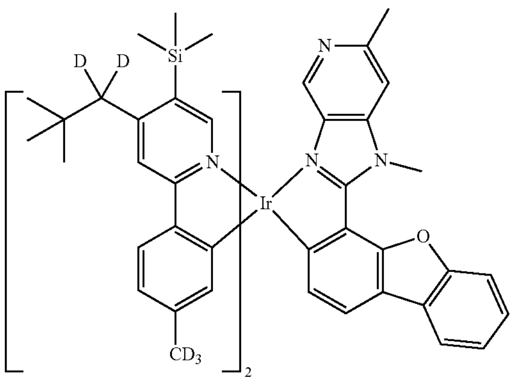
1836
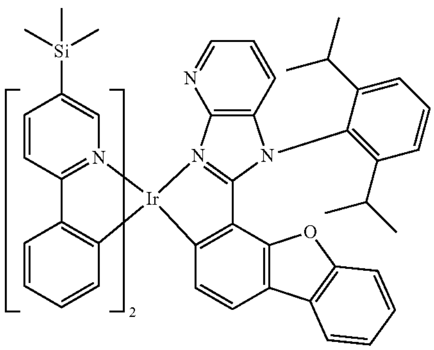
1837
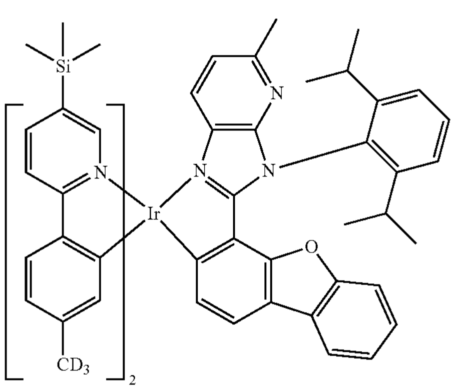
-continued
1838
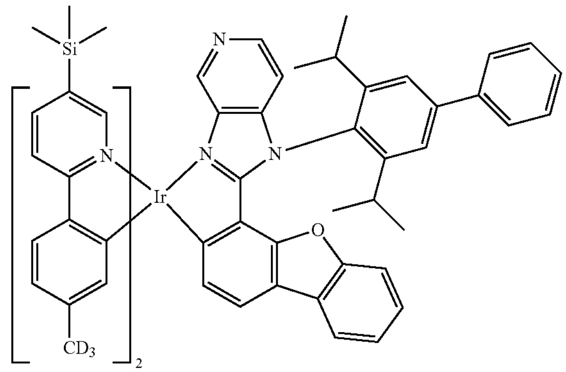
1839
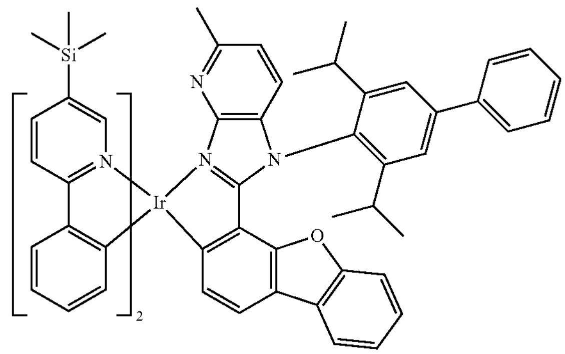
1840
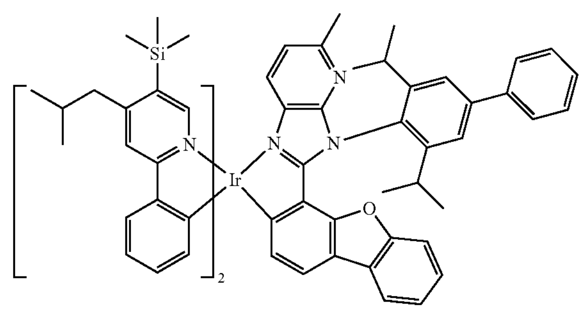
1841
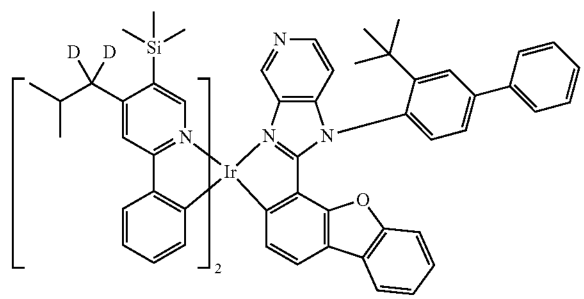

-continued
1842
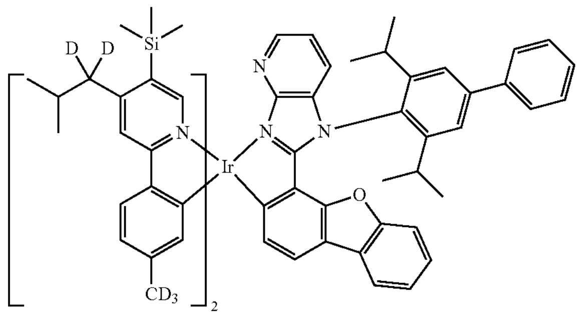
1843
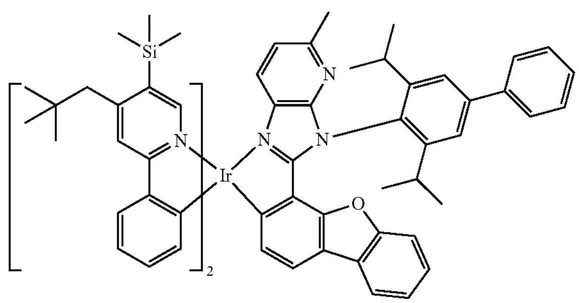
1844
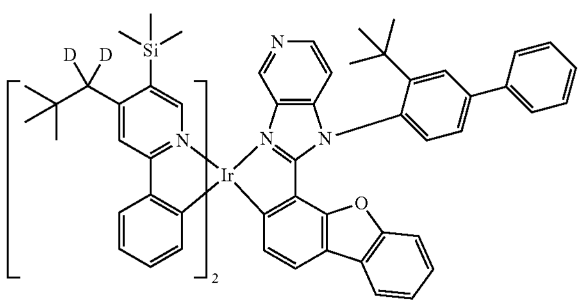
1845
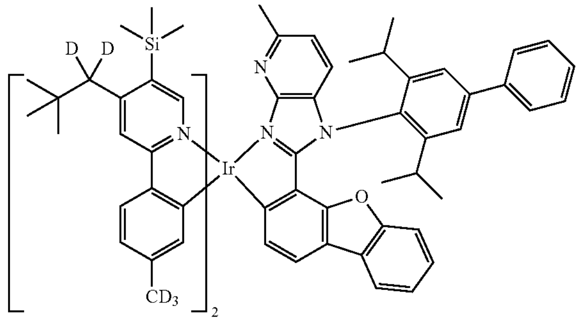
-continued
1846
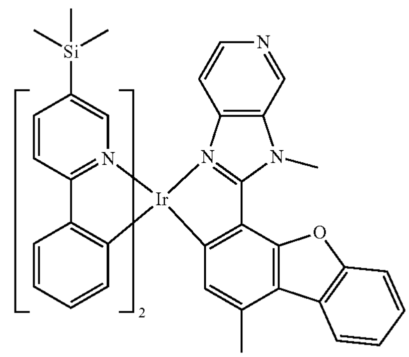
1847
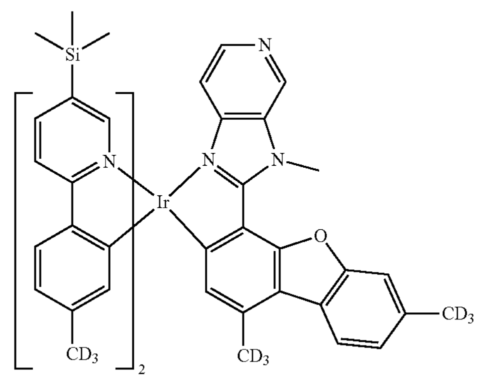
1848
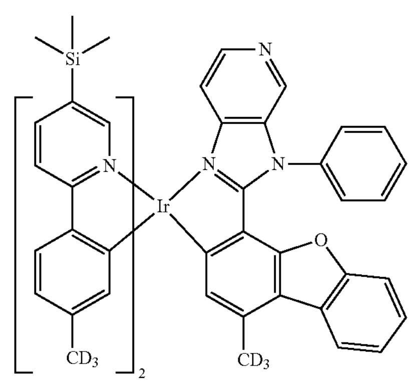
1849
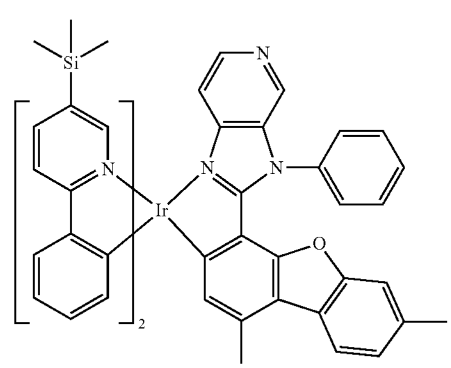

-continued
1850
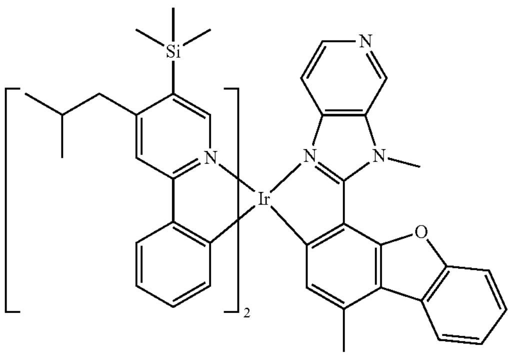
1851
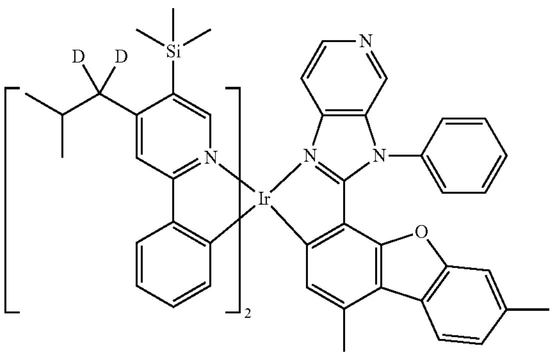
1852
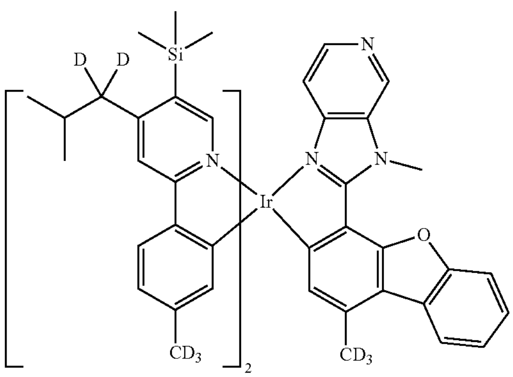
1853
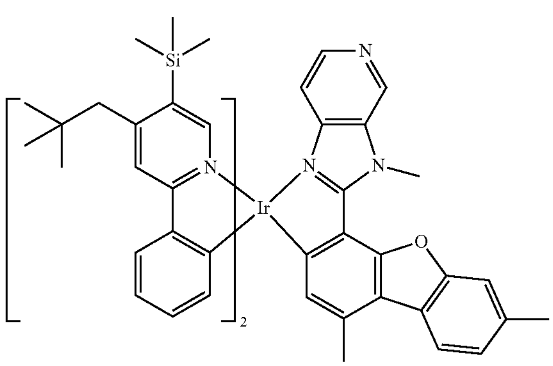
-continued
1854
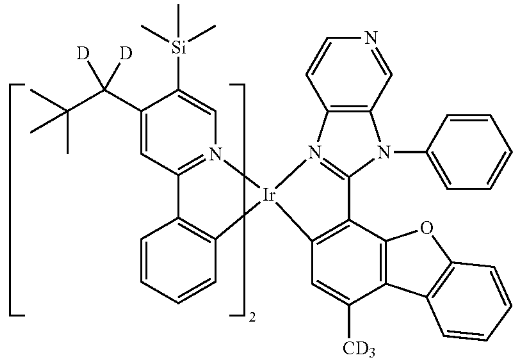
1855
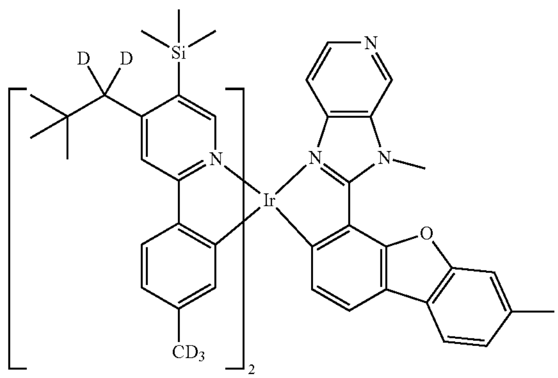
1856
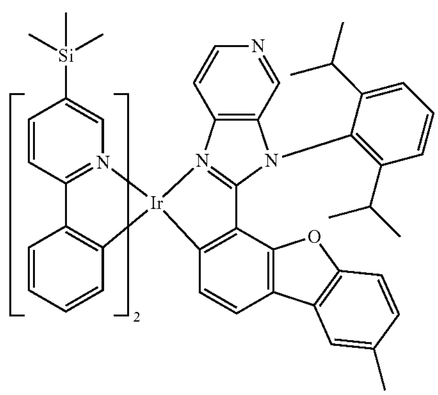
1857
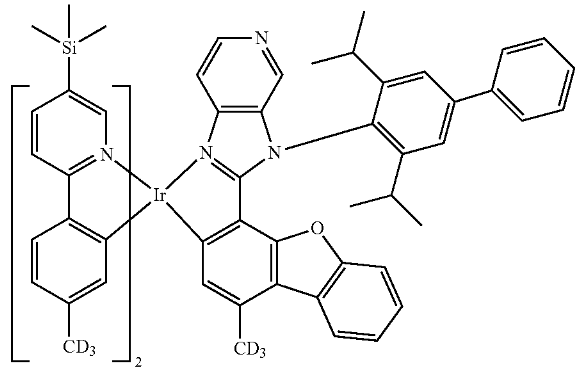

-continued
1858
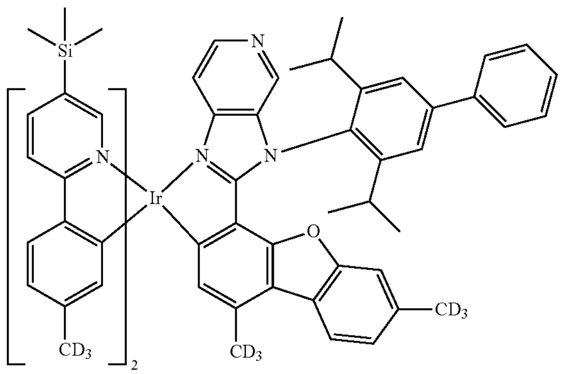
1859
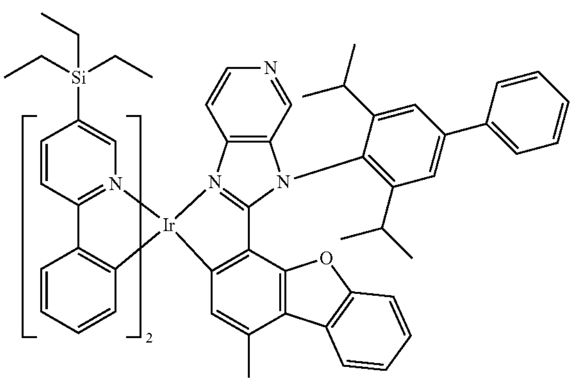
1860
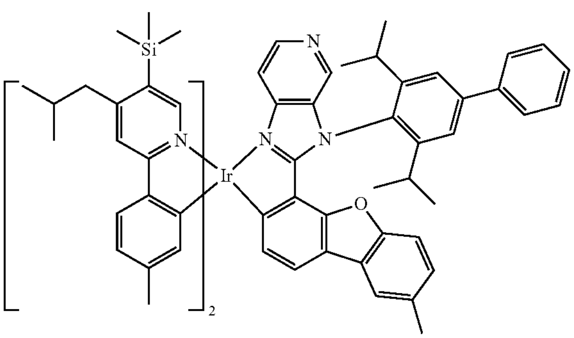
1861
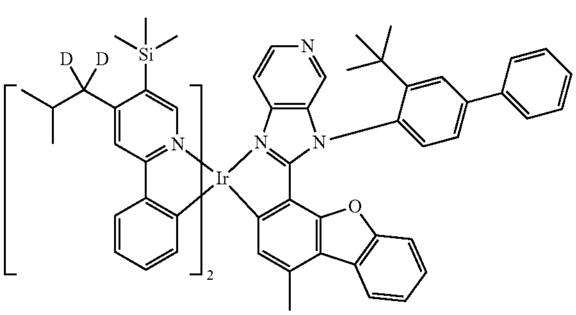
-continued
1862
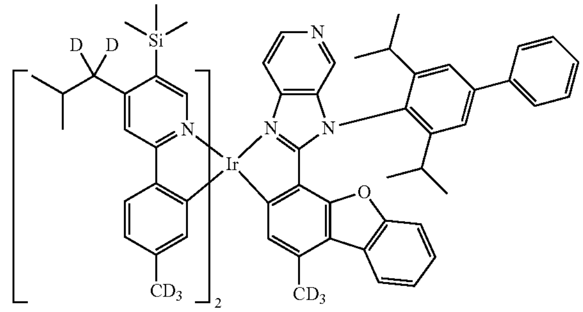
1863
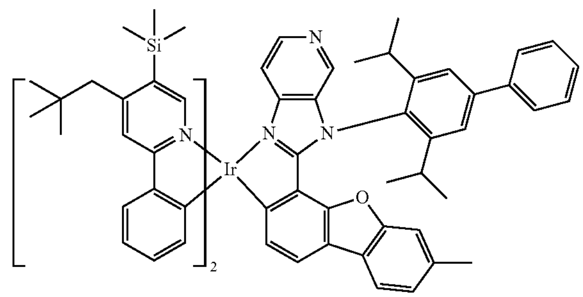
1864
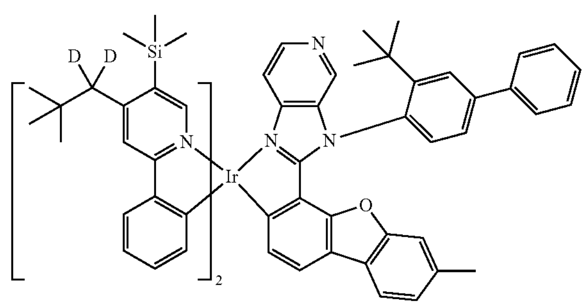
1865
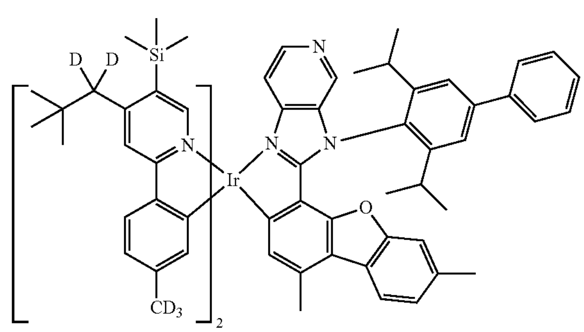

-continued
1866
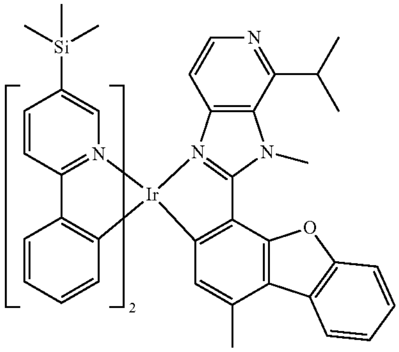
1867
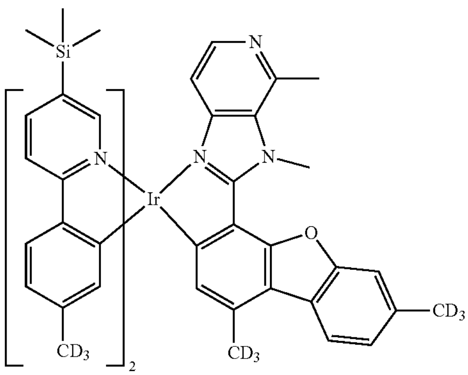
1868
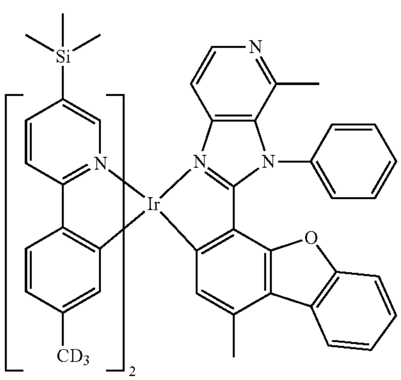
1869
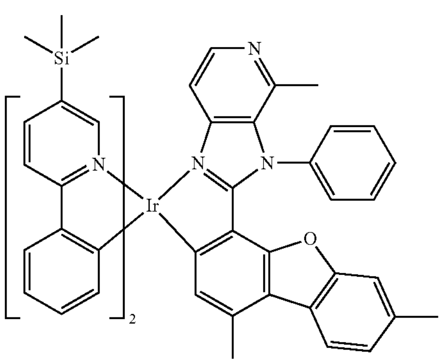
-continued
1870
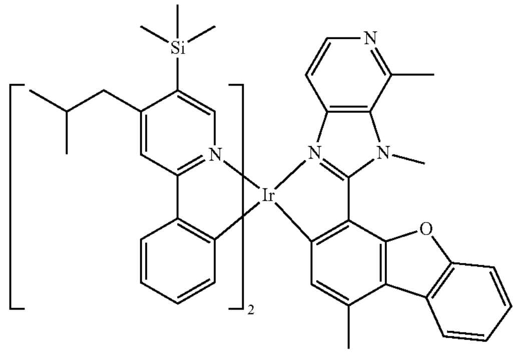
1871
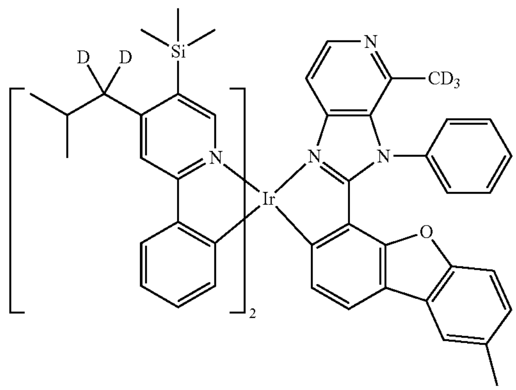
1872
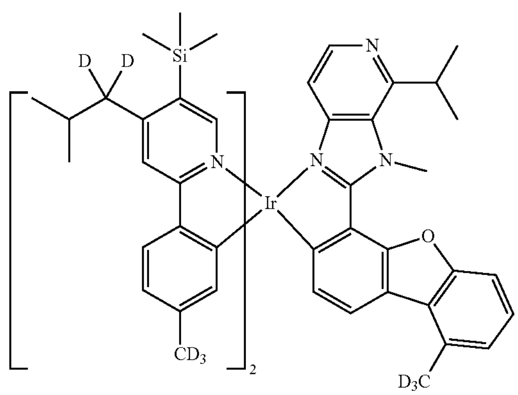
1873
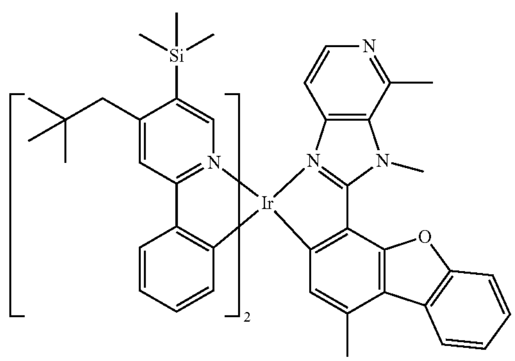

-continued
1874
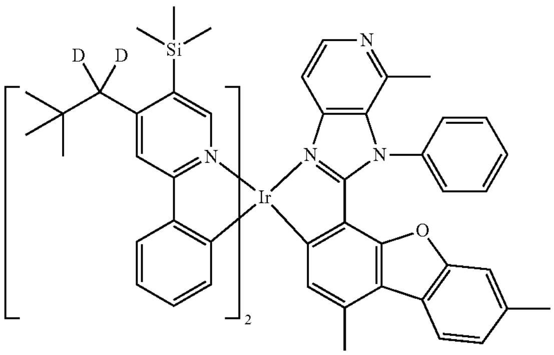
1875
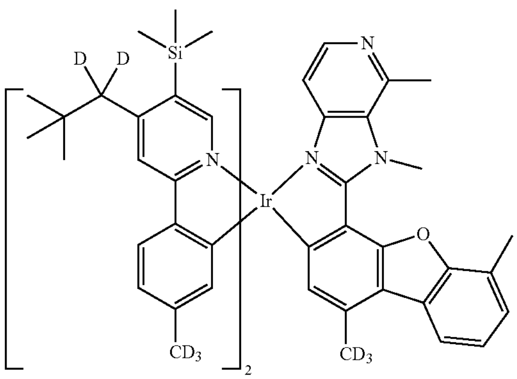
1876
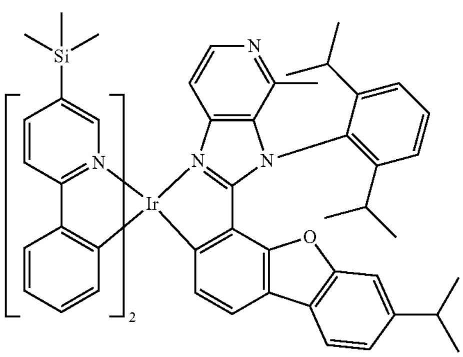
1877
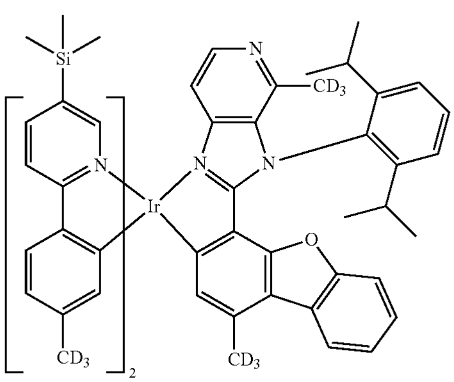
-continued
1878
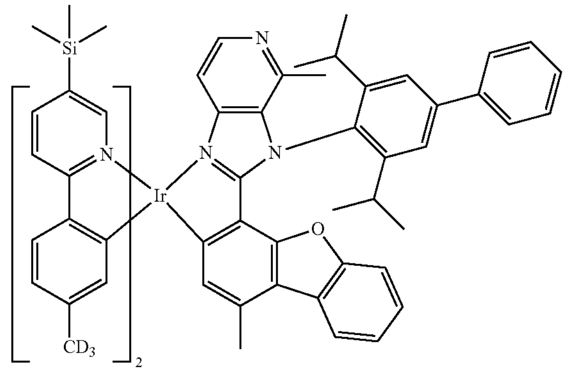
1879
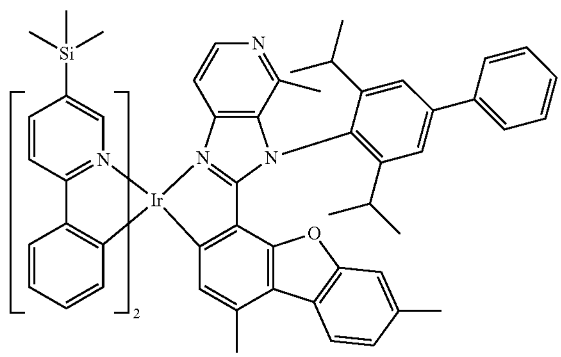
1880
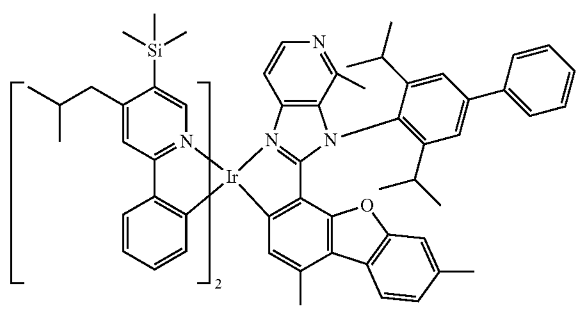
1881
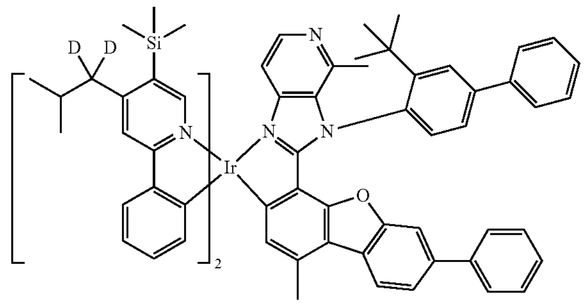

-continued
1882
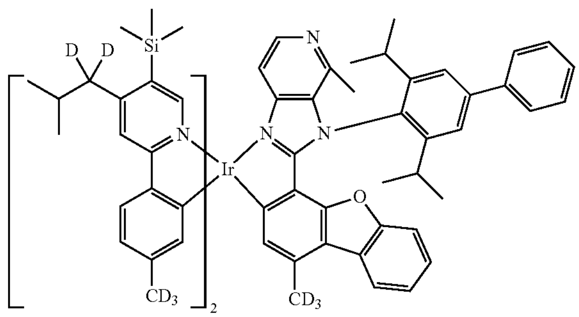
1883
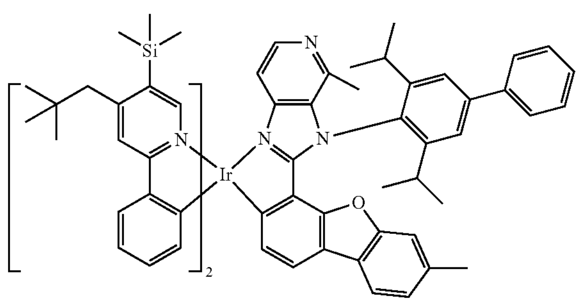
1884
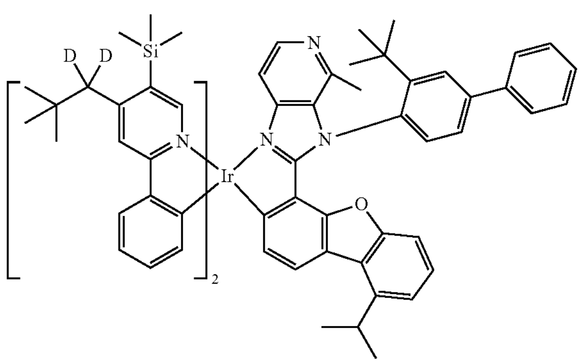
1885
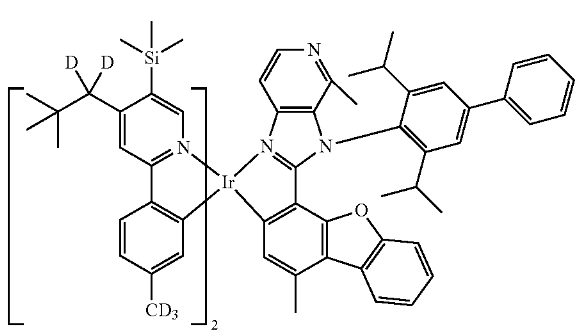
1886
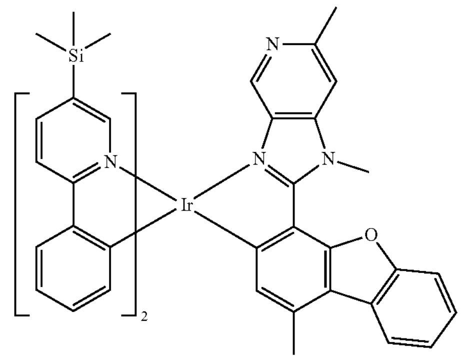
1887
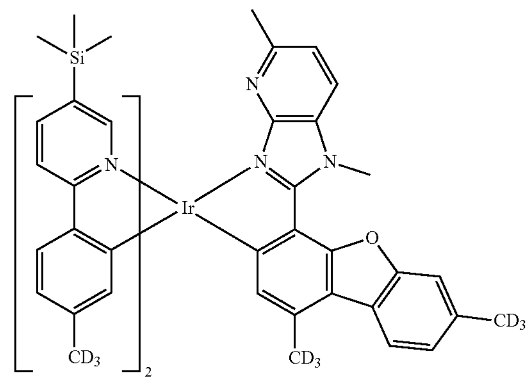
1888
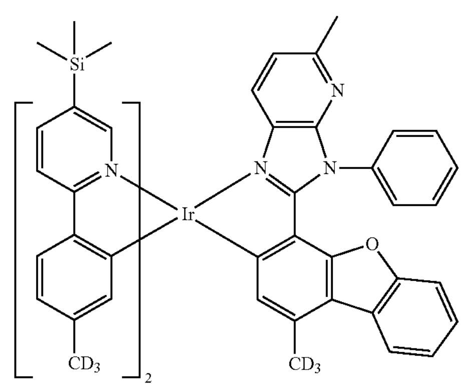
1889
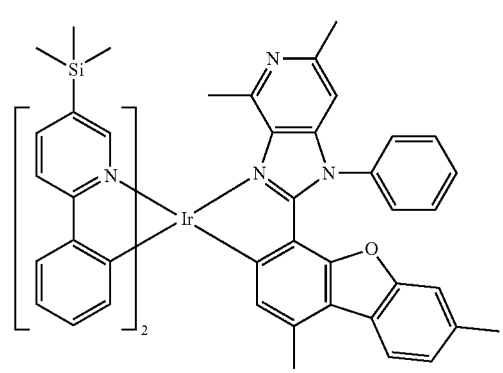

-continued
1890
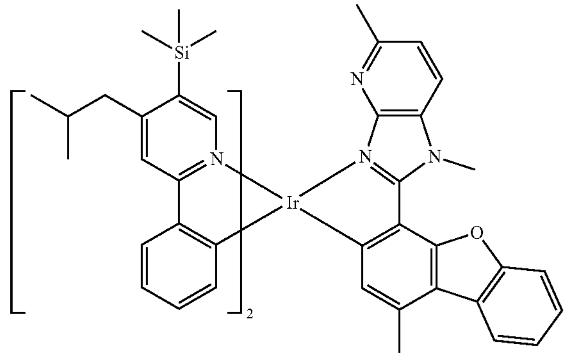
1891
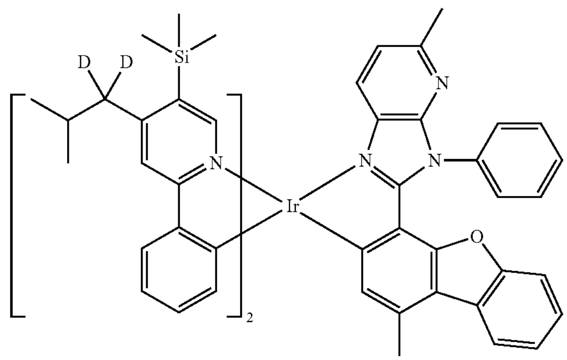
1892
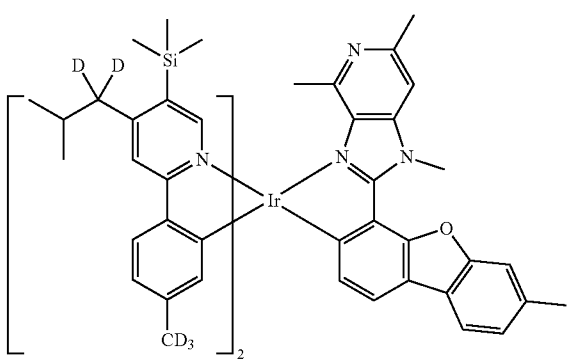
1893
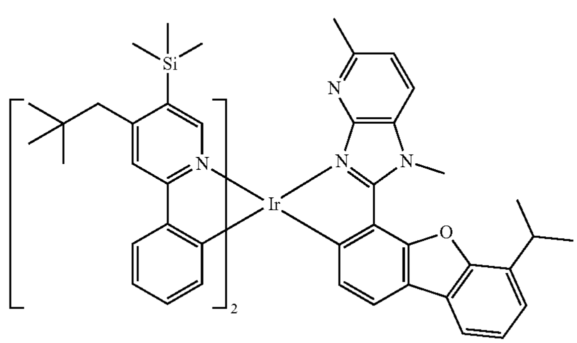
-continued
1894
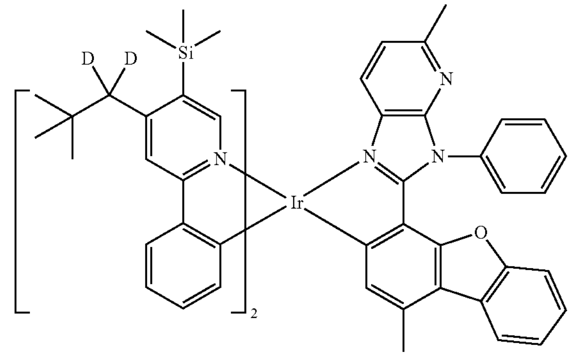
1895
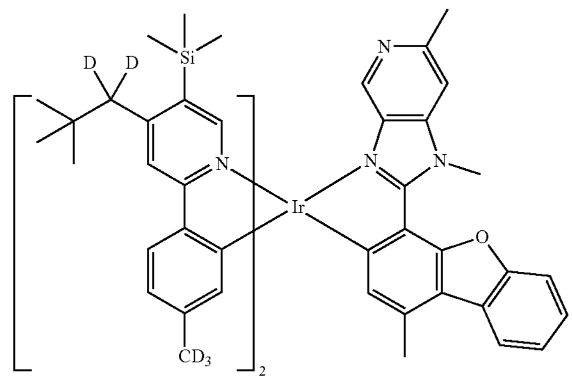
1896
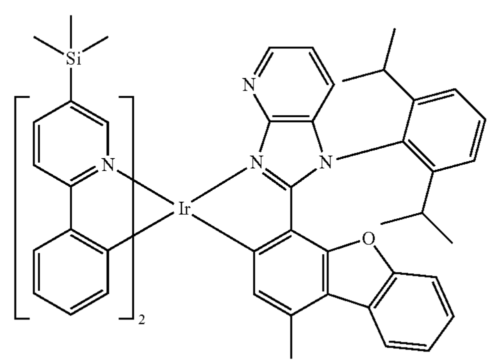
1897
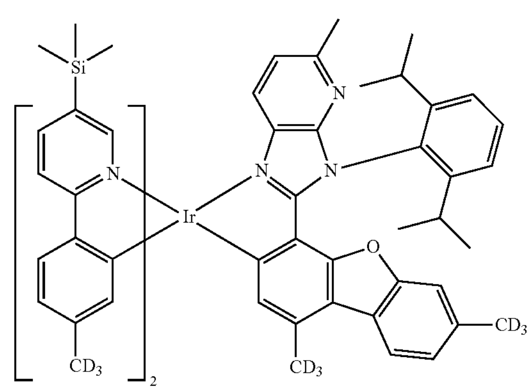

-continued
1898
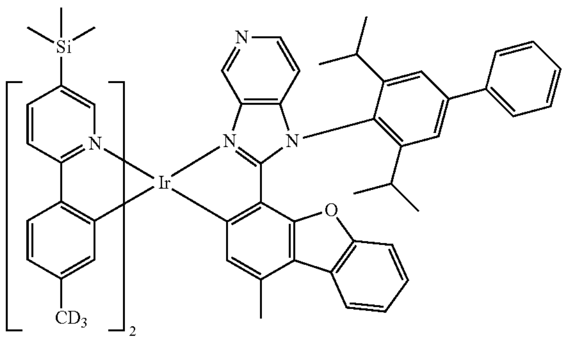
1899
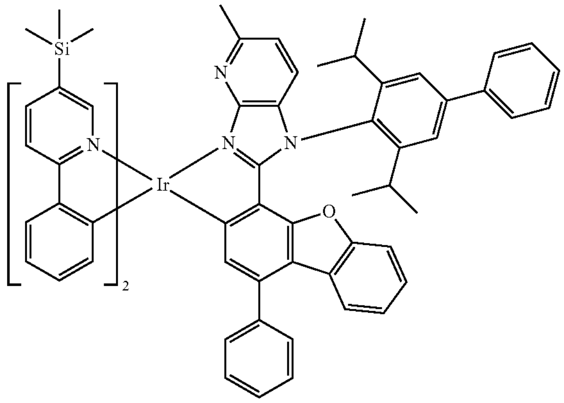
1900
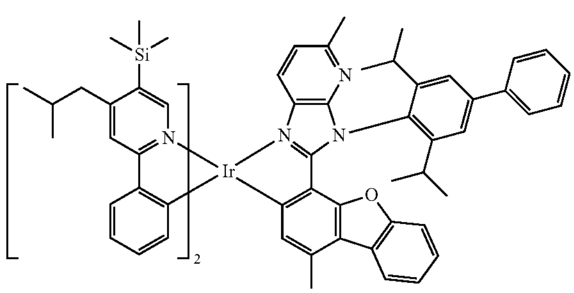
1901
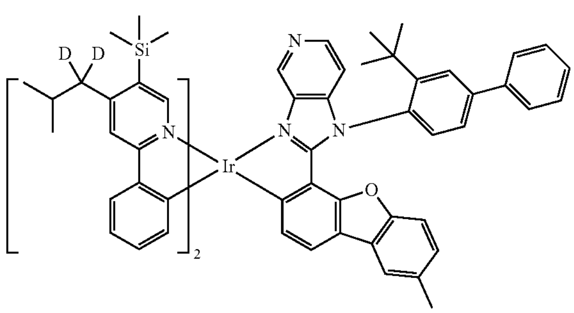
-continued
1902
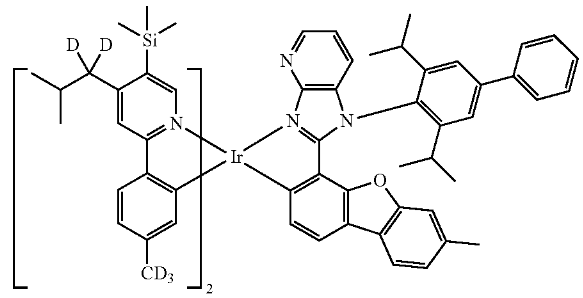
1903
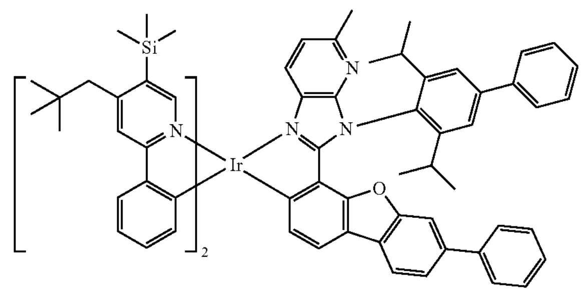
1904
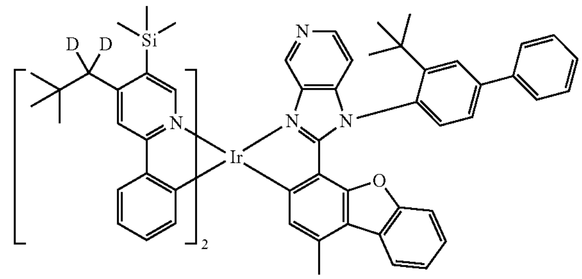
1905
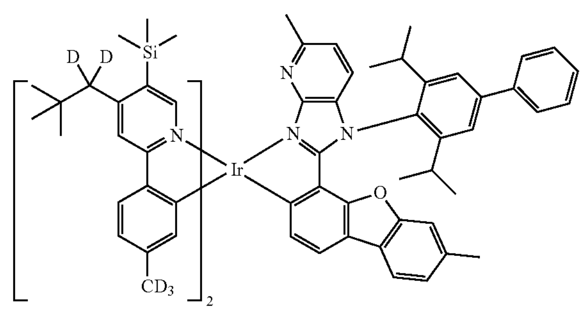
1906
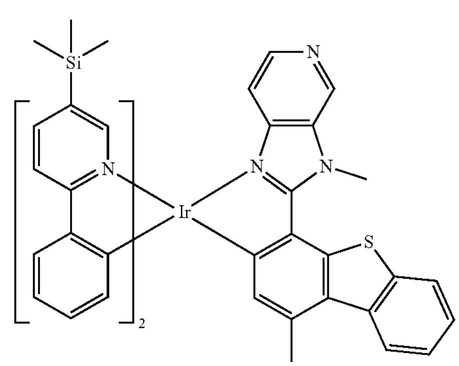

-continued
1907
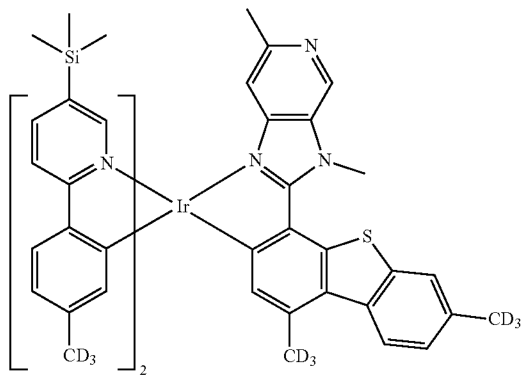
1908
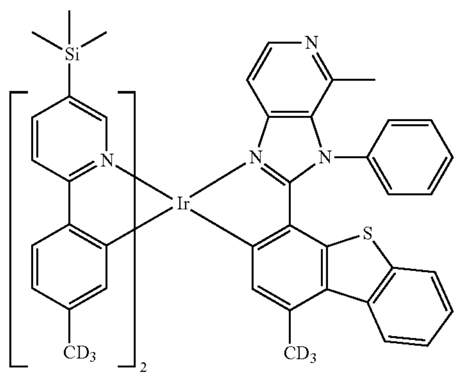
1909
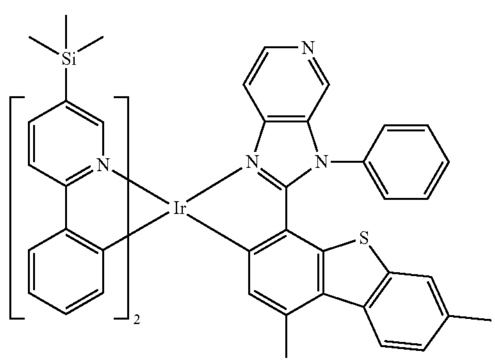
1910
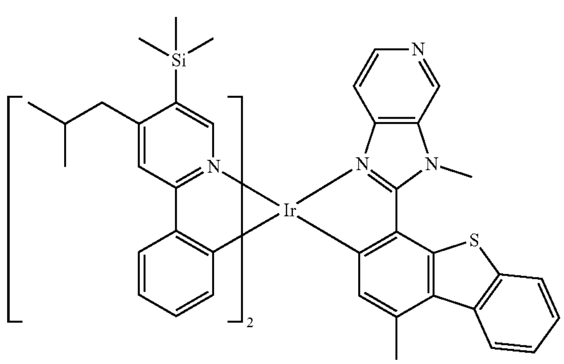
-continued
1911
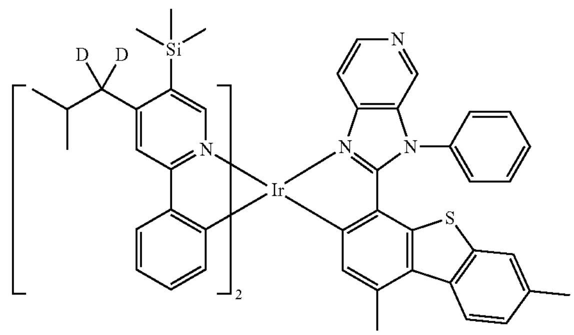
1912
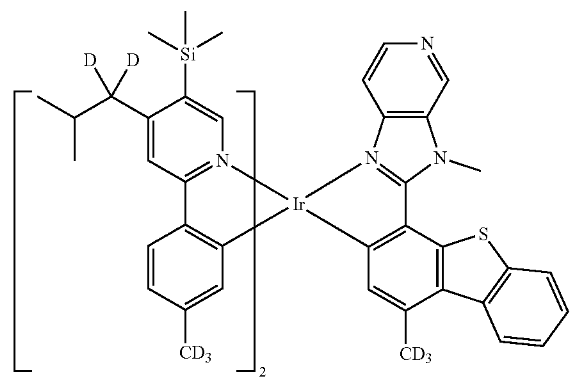
1913
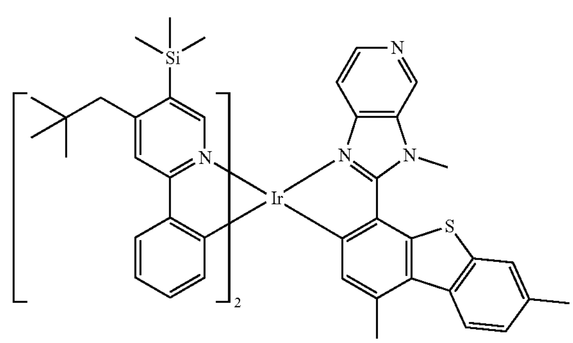
1914
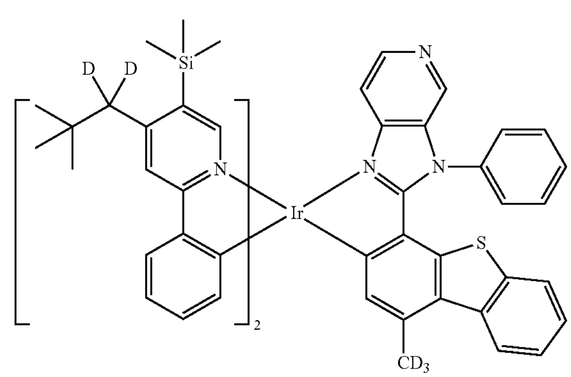

-continued
1915
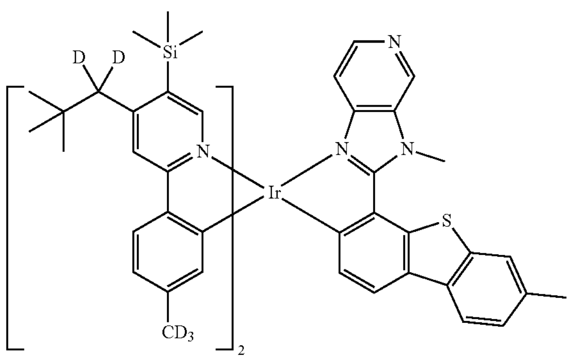
1916
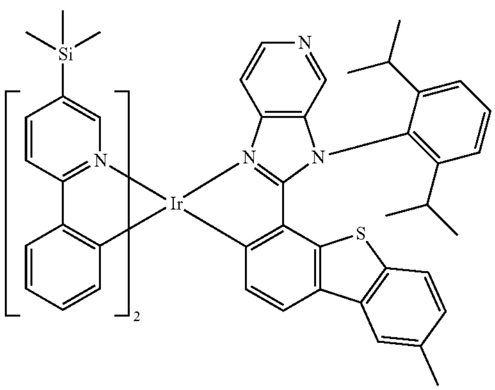
1917
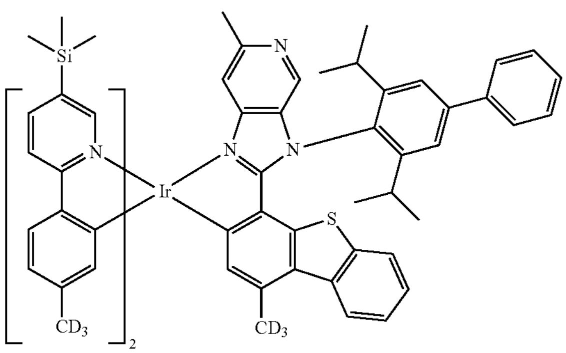
1918
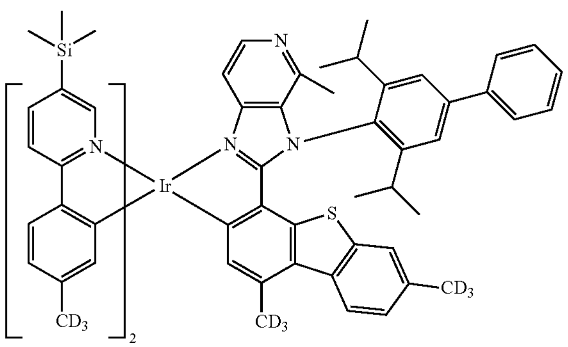
-continued
1919
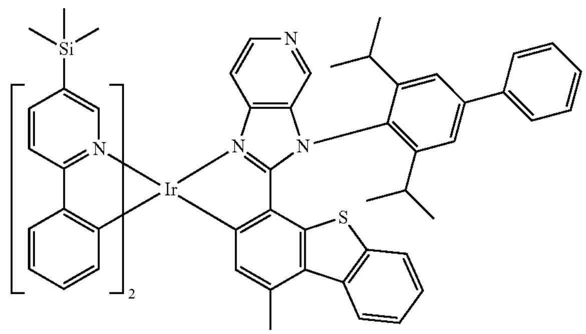
1920
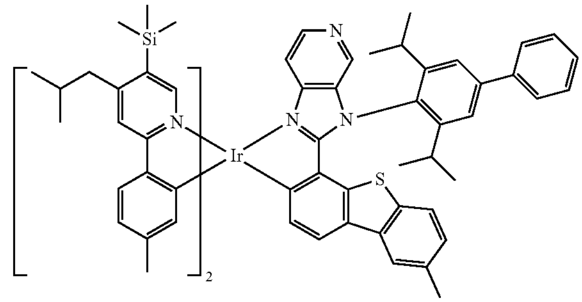
1921
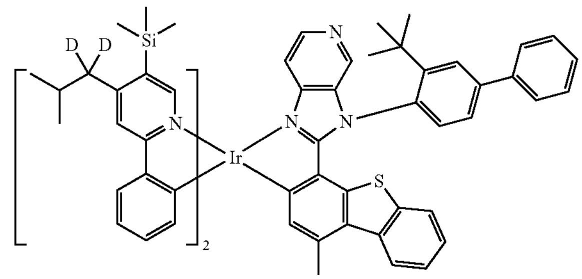
1922
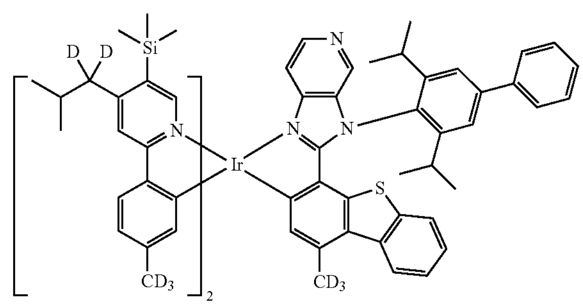
1923
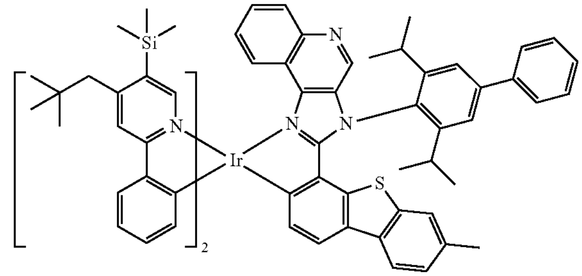

-continued
1924
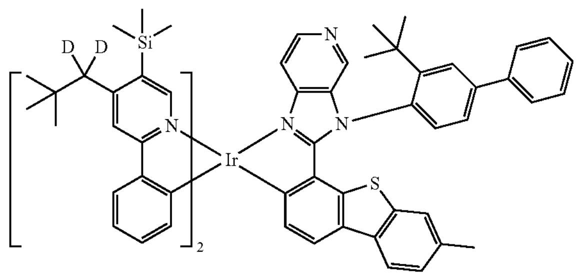
1925
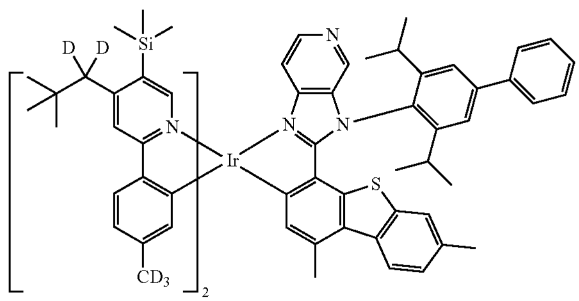
1926
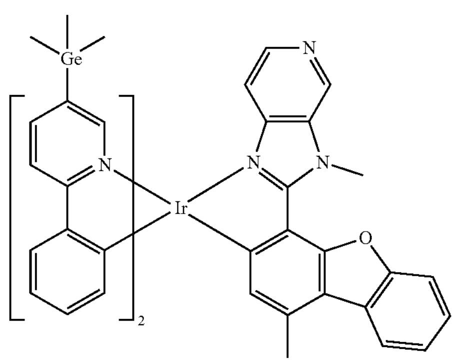
1927
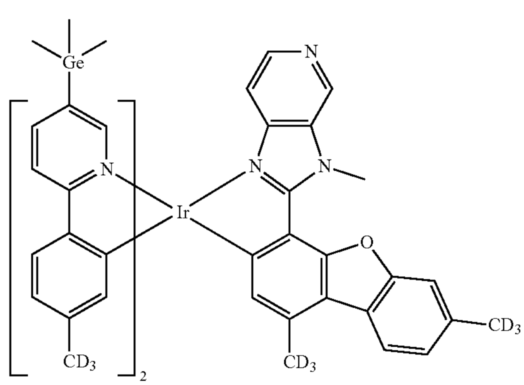
-continued
1928
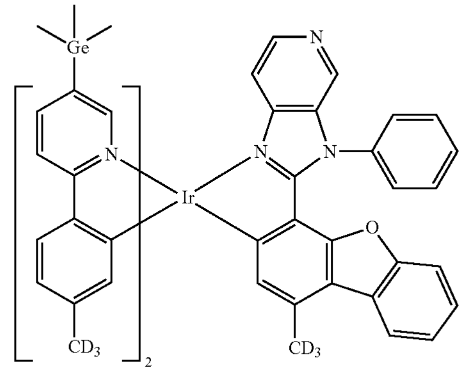
1929
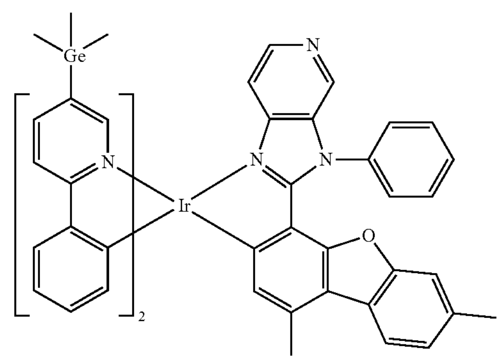
1930
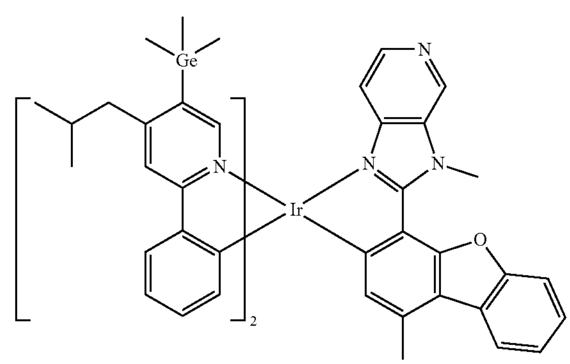
1931
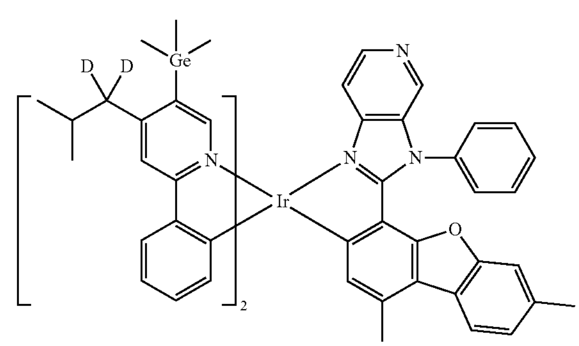

-continued
1932
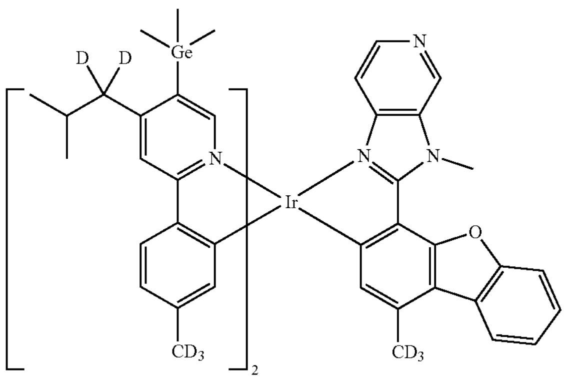
1933
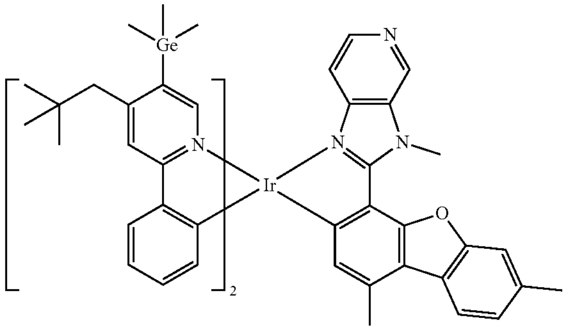
1934
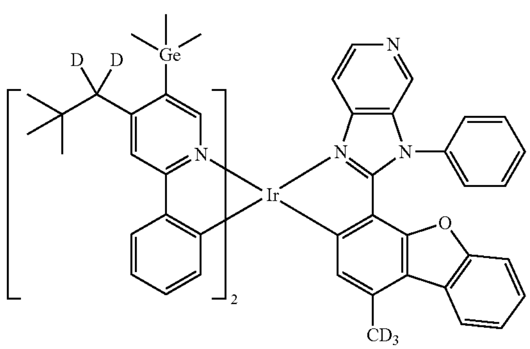
1935
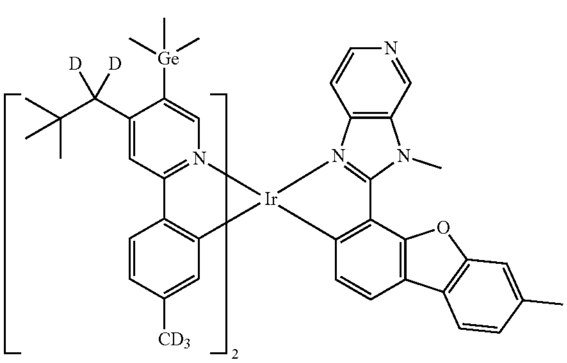
-continued
1936
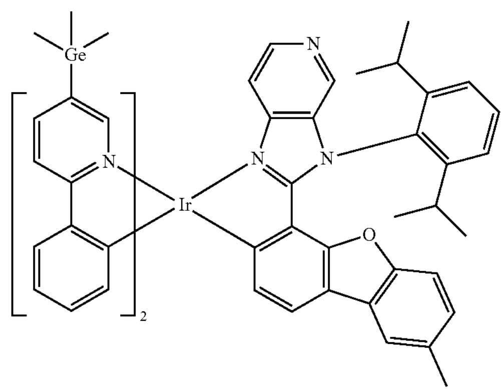
1937
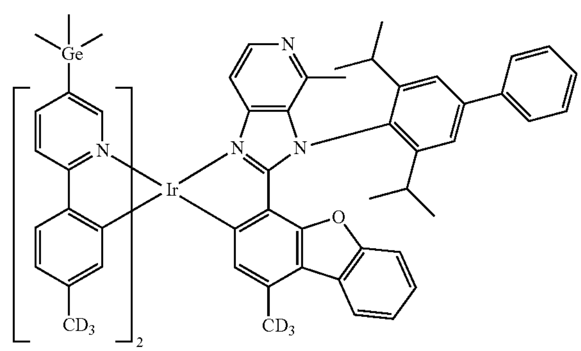
1938
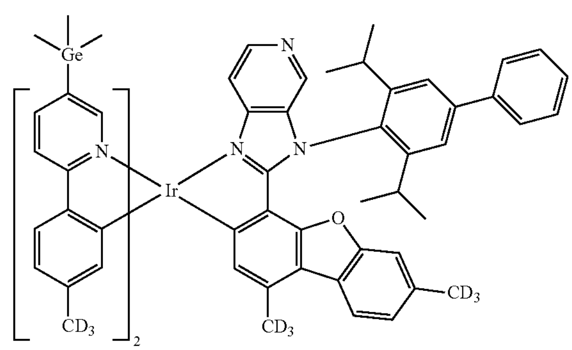
1939
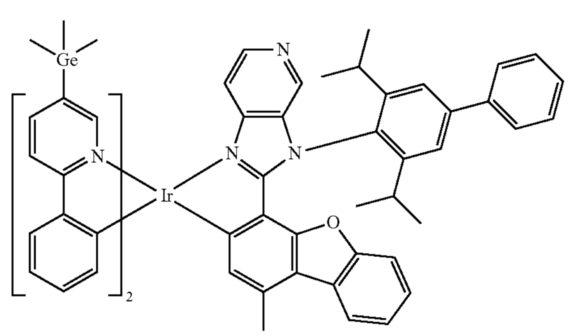

-continued
1940
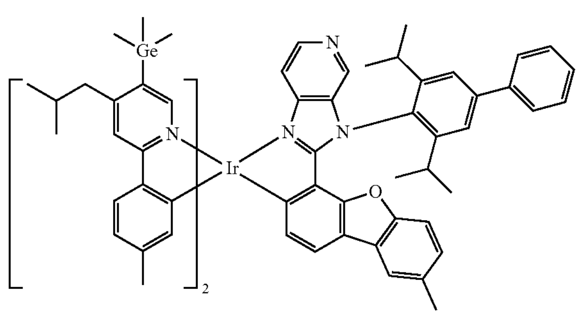
1941
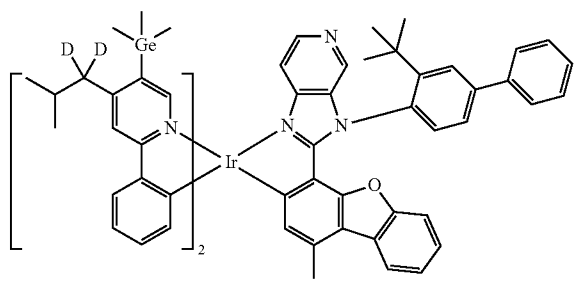
1942
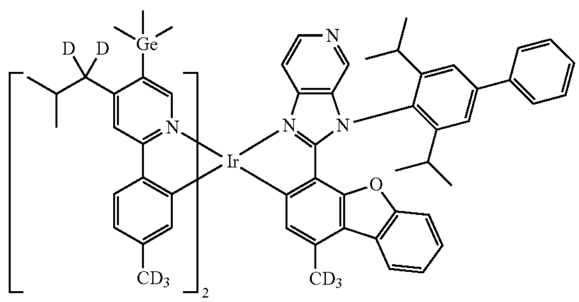
1943
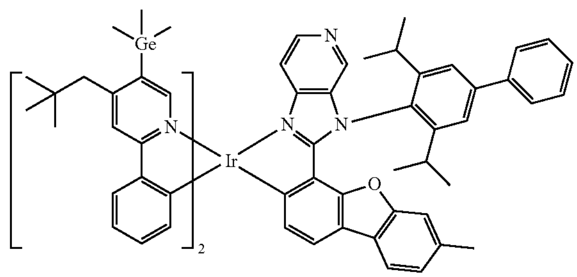
1944
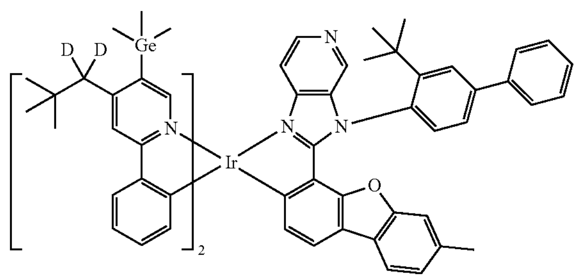
-continued
1945
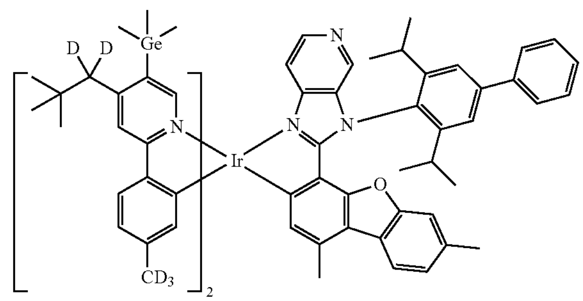
1946
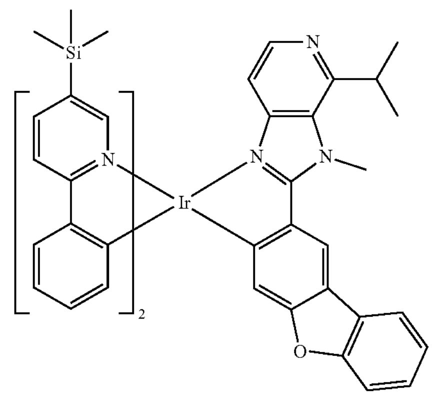
1947
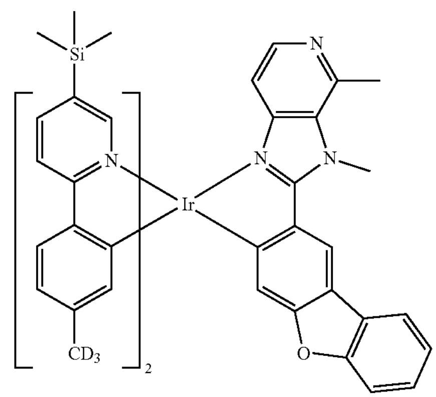
1948
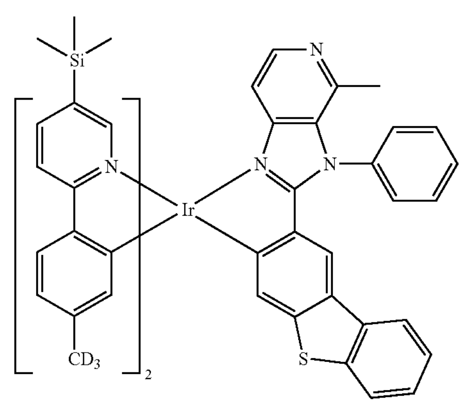

-continued
1949
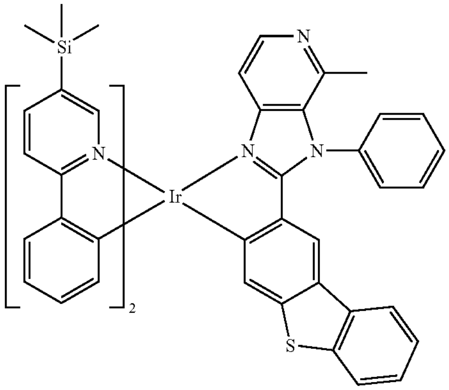
1950
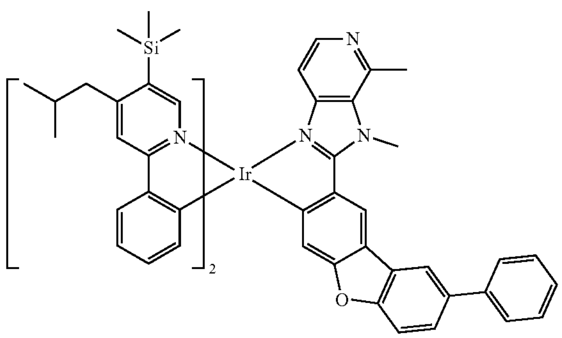
1951
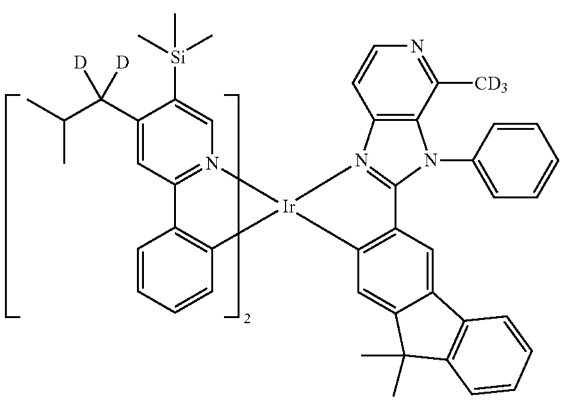
1952
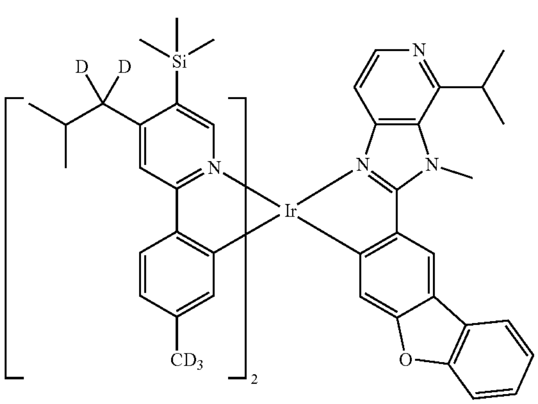
-continued
1953
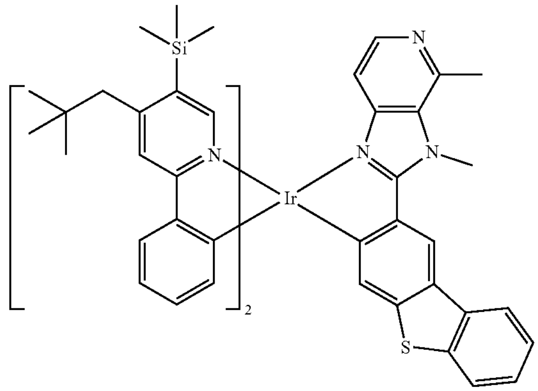
1954
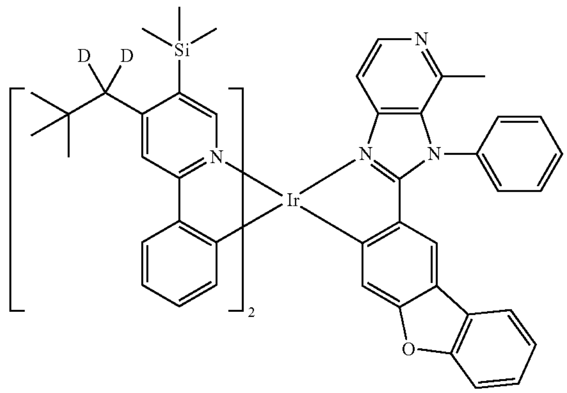
1955
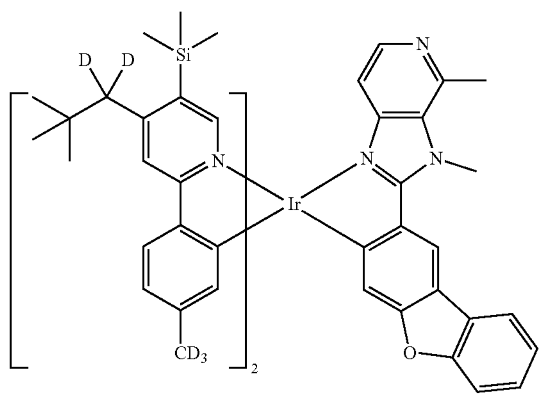
1956
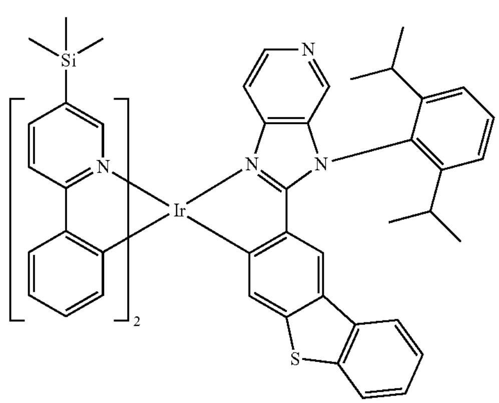

-continued
1957
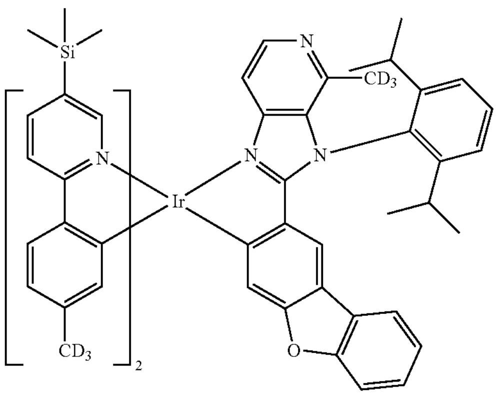
1958
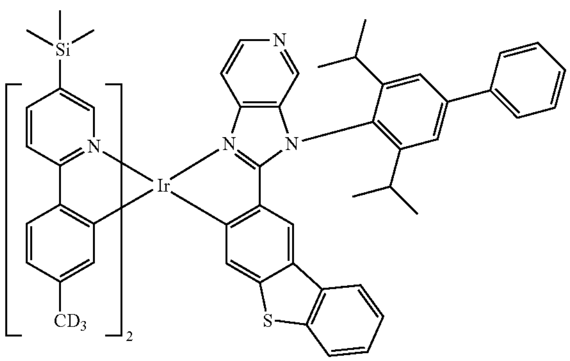
1959
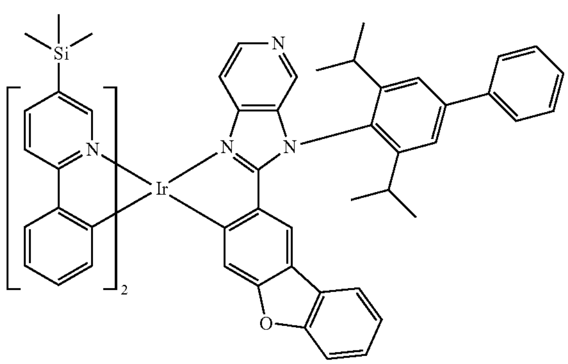
1960
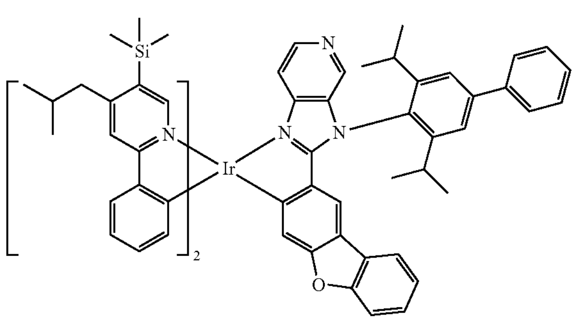
-continued
1961
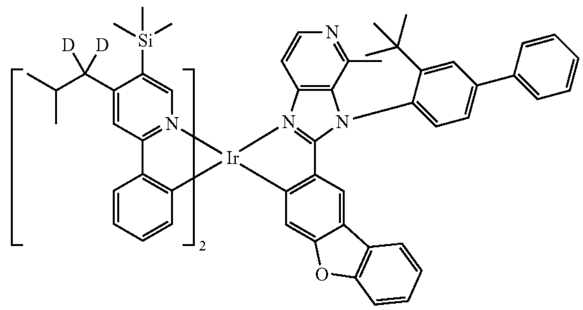
1962
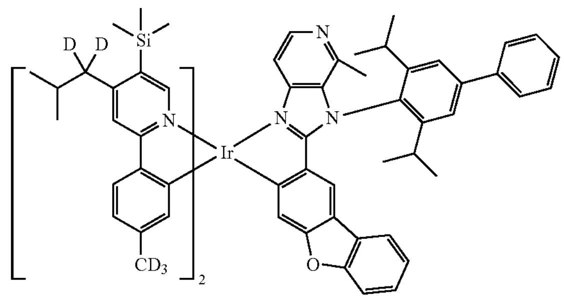
1963
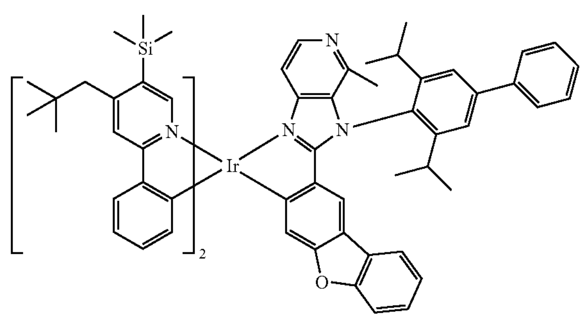
1964
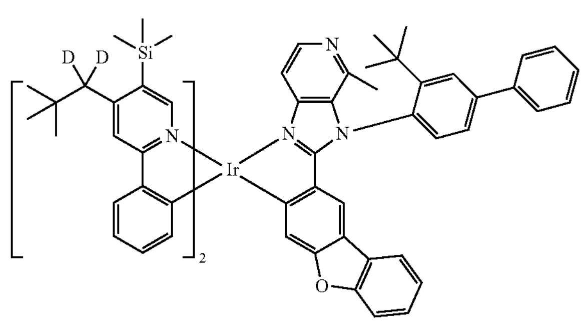

-continued
1965
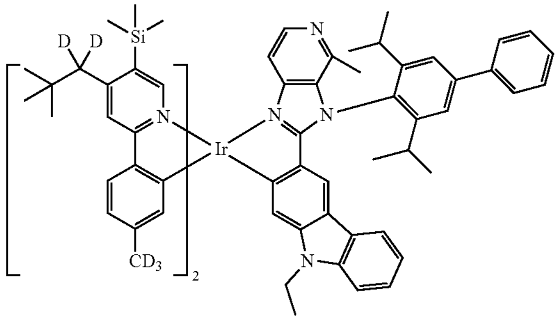
1966
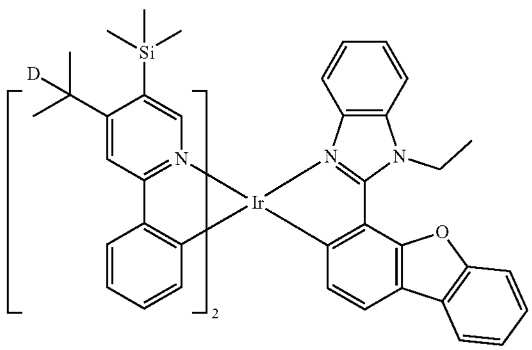
1967
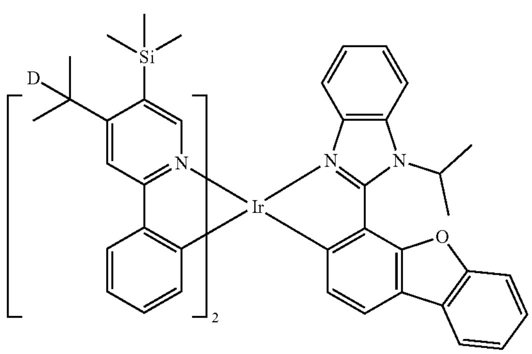
1968
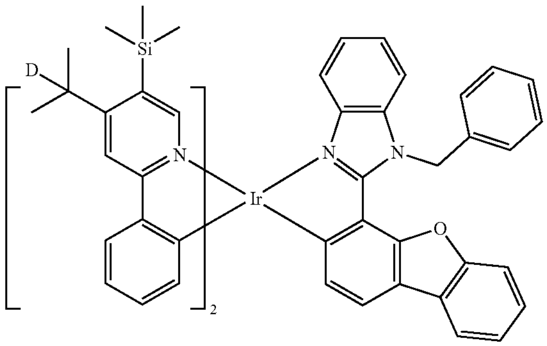
-continued
1969
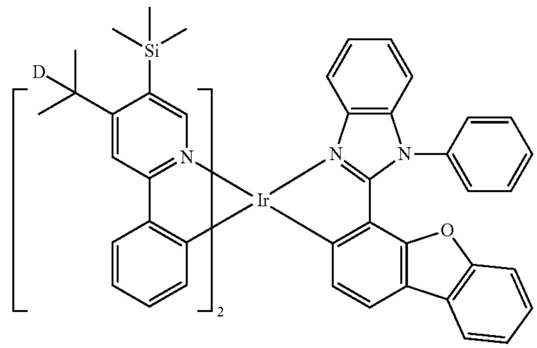
1970
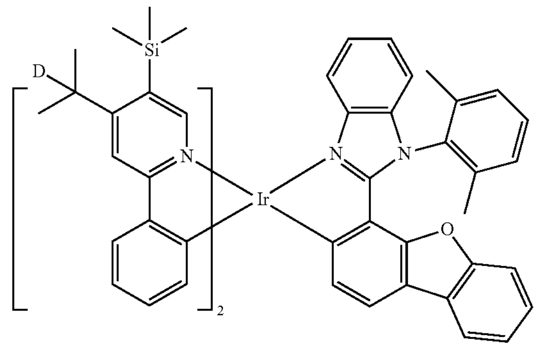
1971
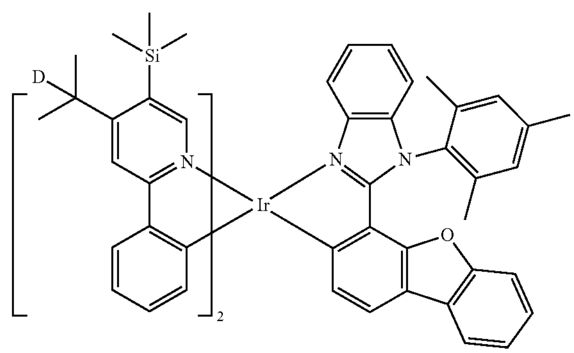
1972
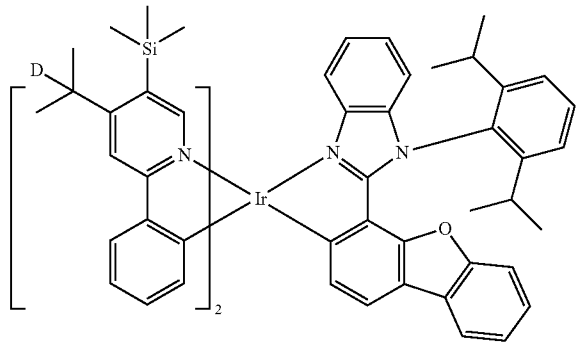

-continued
1973
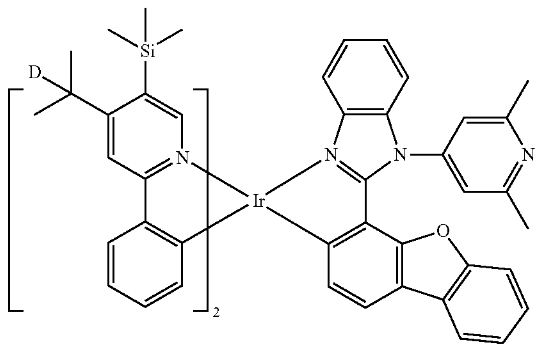
1974
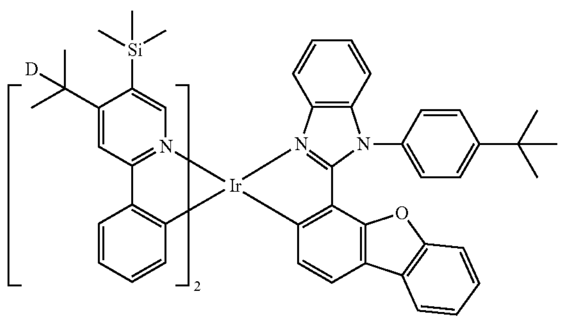
1975
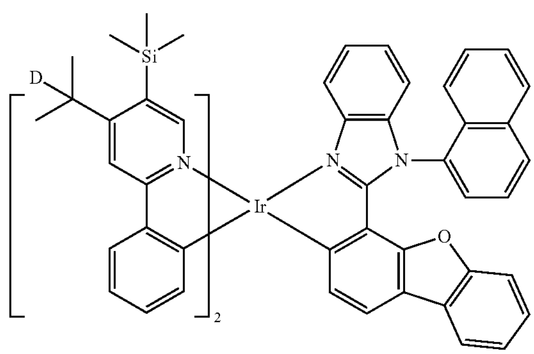
1976
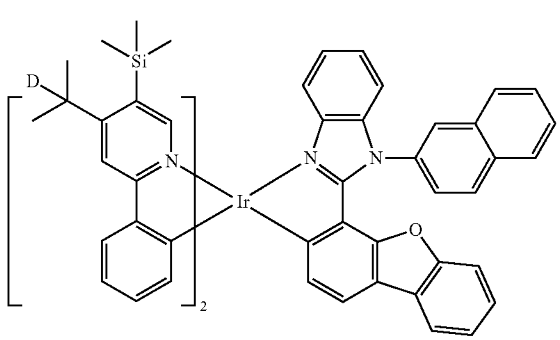
-continued
1977
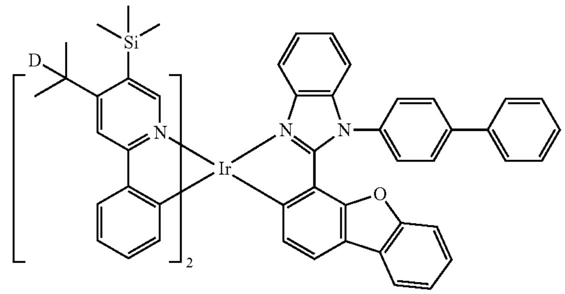
1978
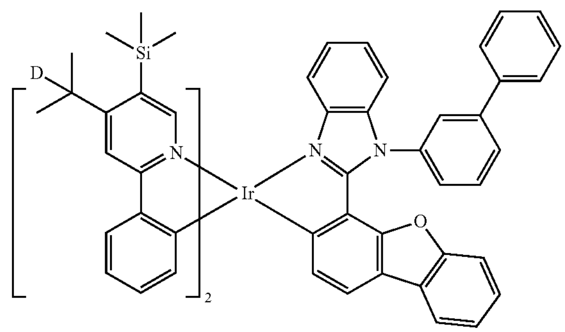
1979
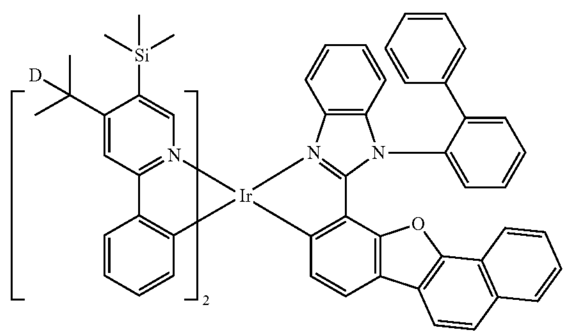
1980
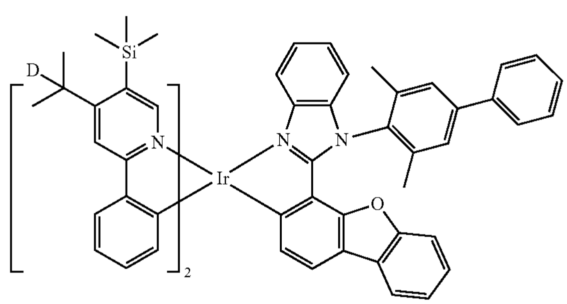
1981
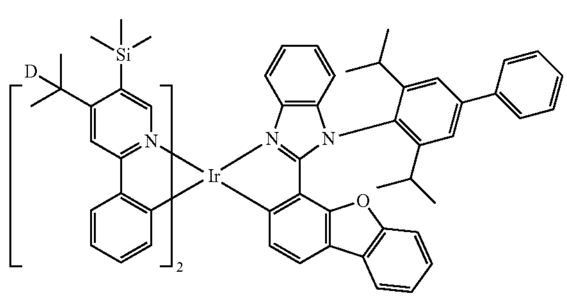

1982
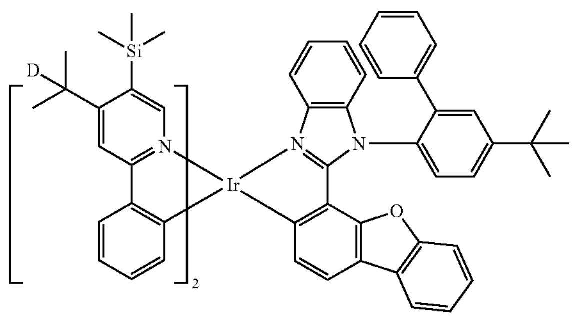
1983
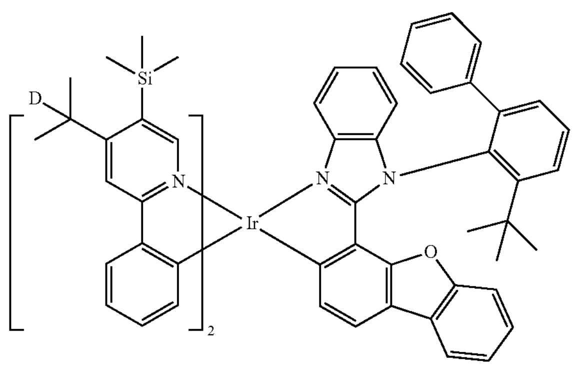
1984
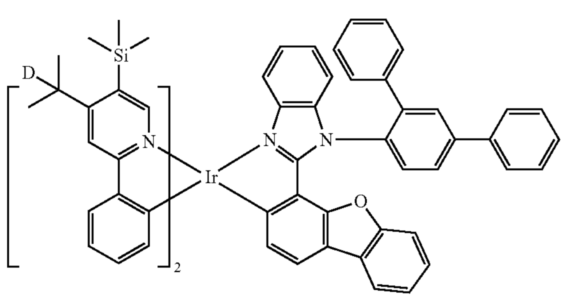
1985
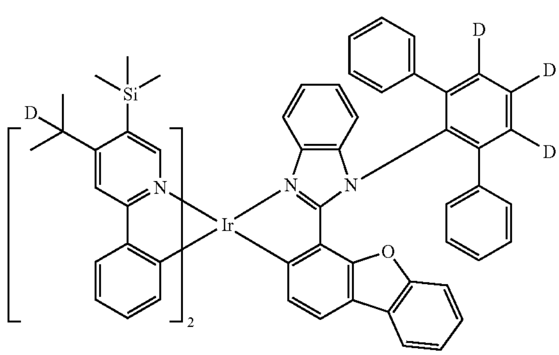
1986
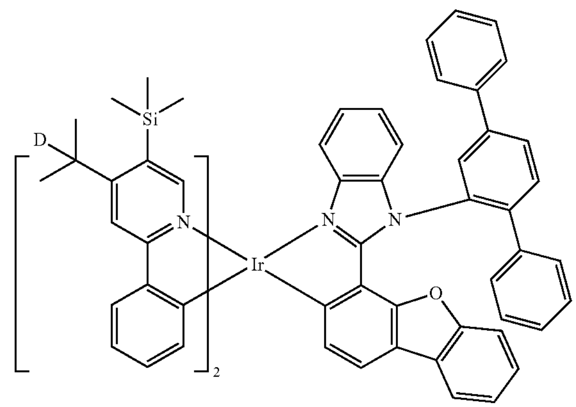
1987
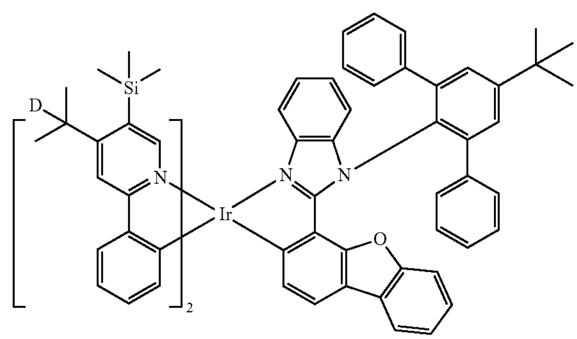
1988
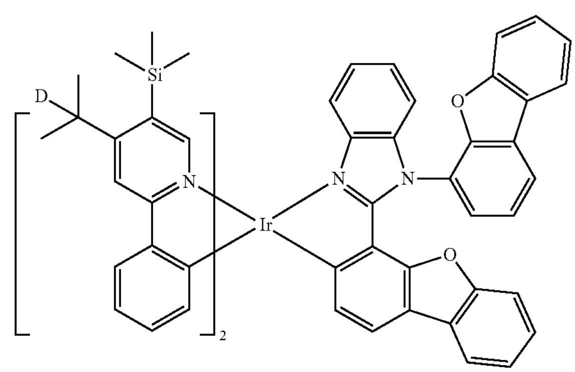
1989
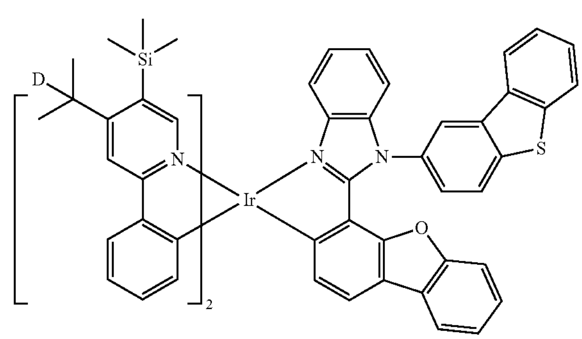

-continued
1990
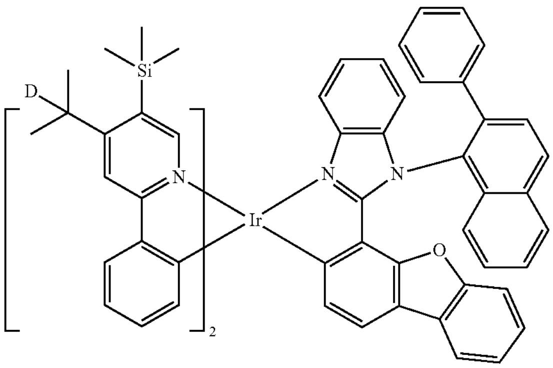
1991
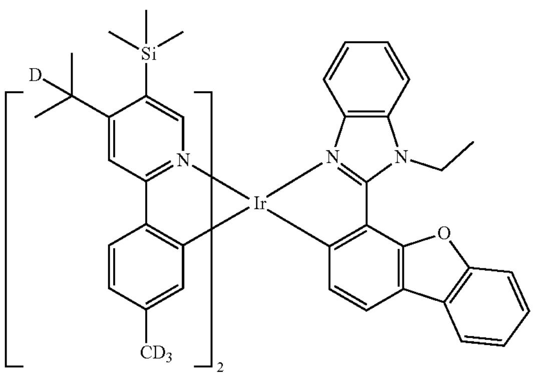
1992
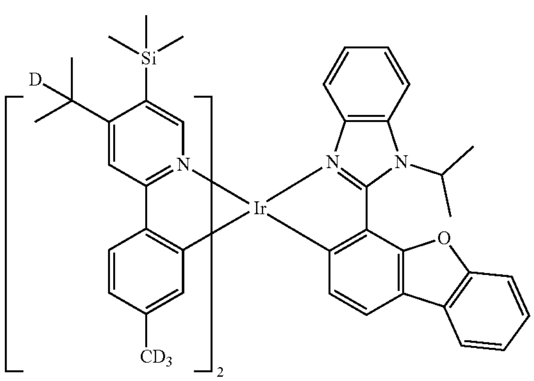
1993
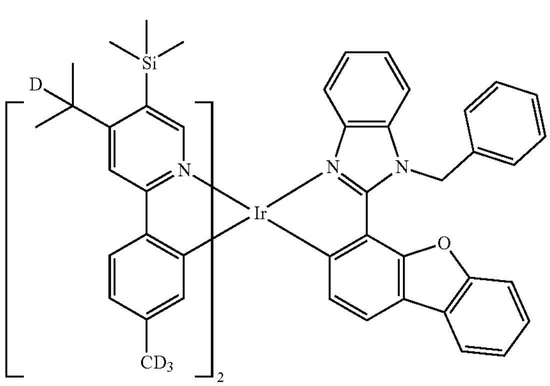
-continued
1994
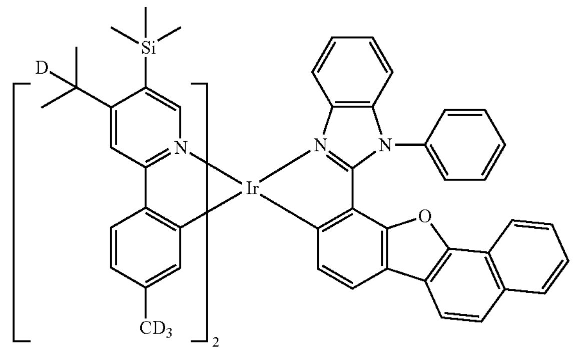
1995
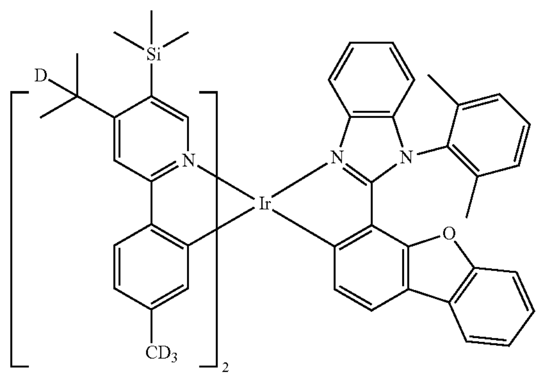
1996
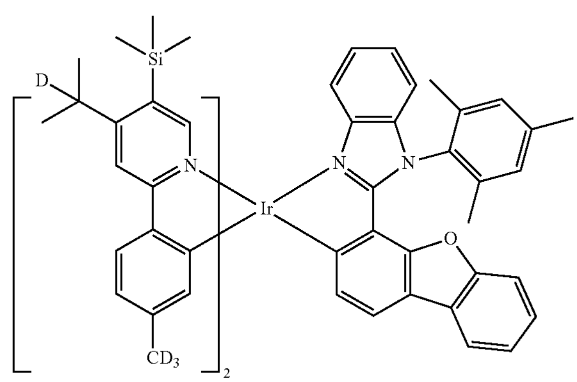
1997
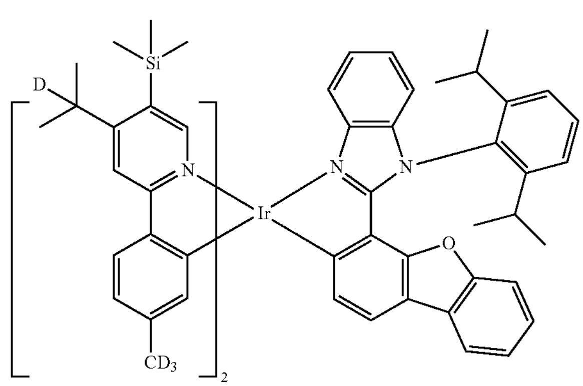

-continued
1998
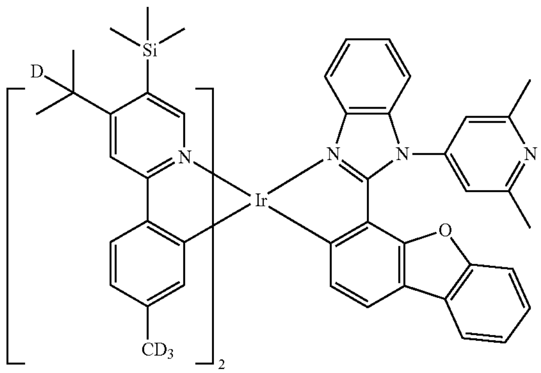
1999
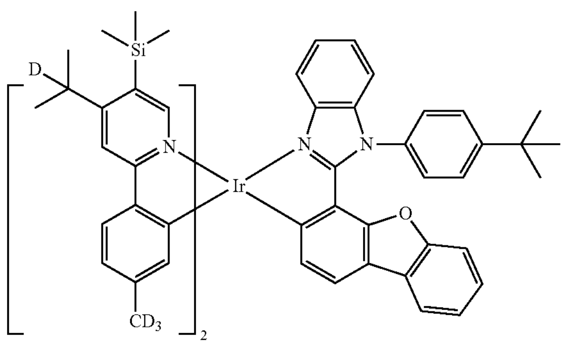
2000
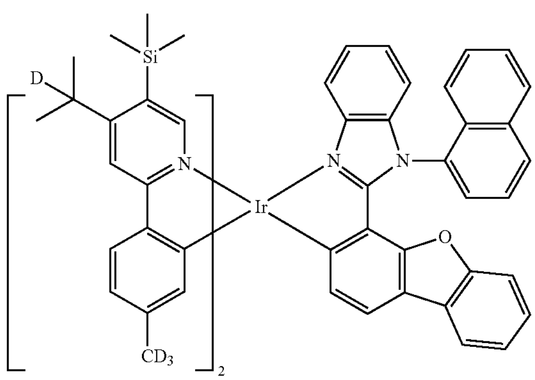
2001
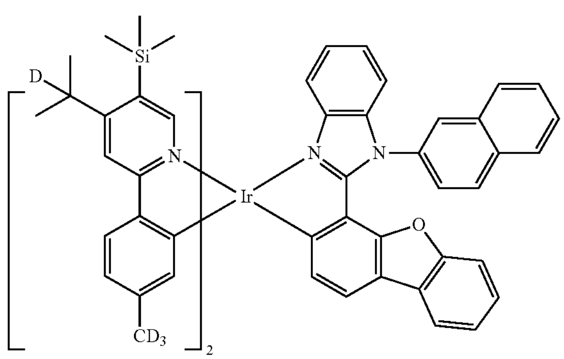
-continued
2002
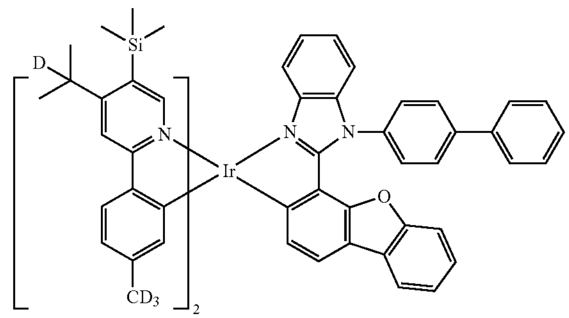
2003
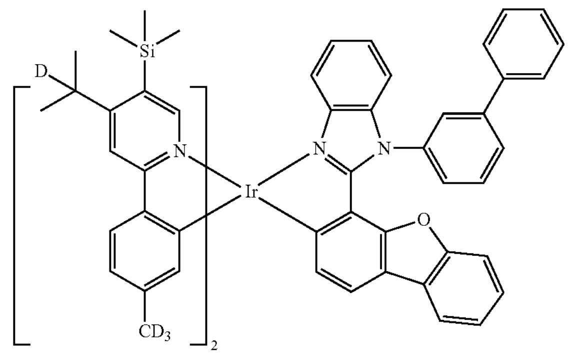
2004
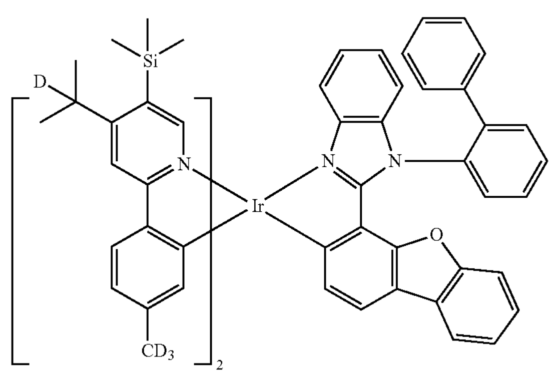
2005
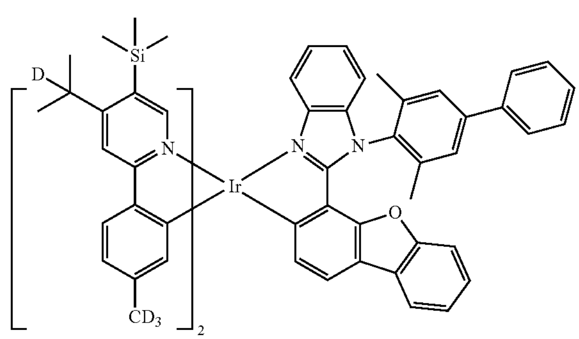

-continued
2006
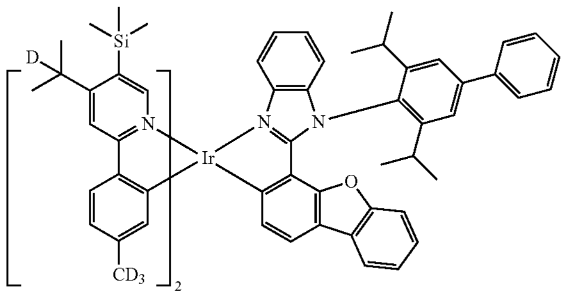
2007
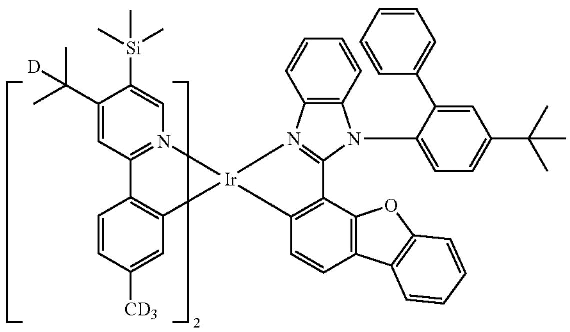
2008
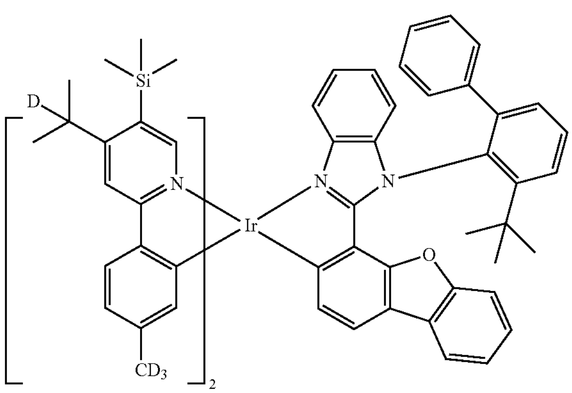
2009
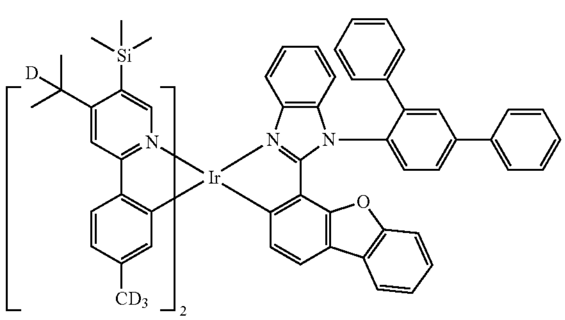
-continued
2010
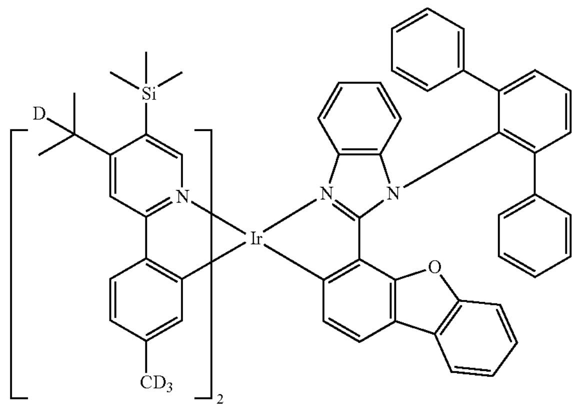
2011
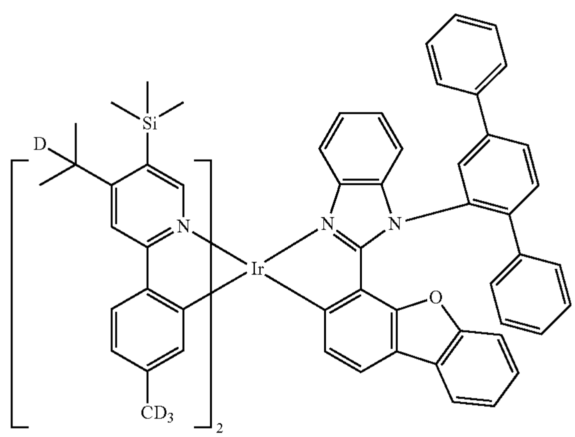
2012
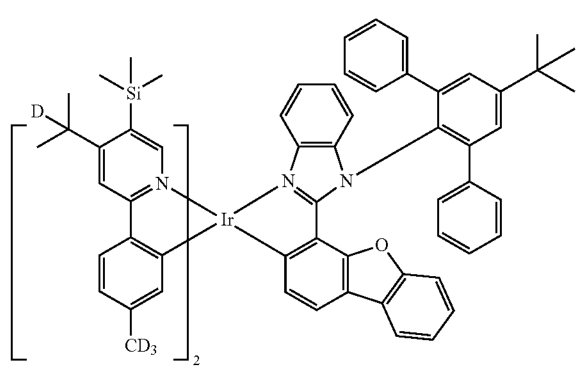

-continued
2013
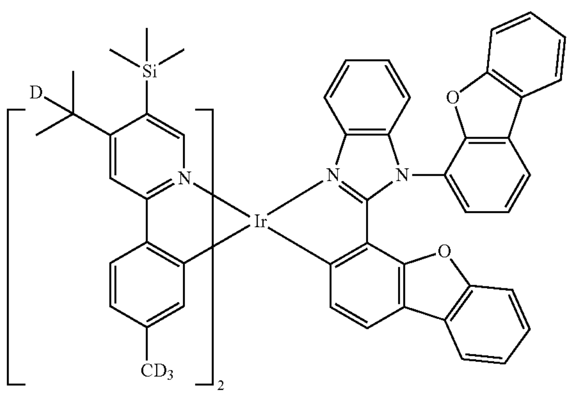
2014
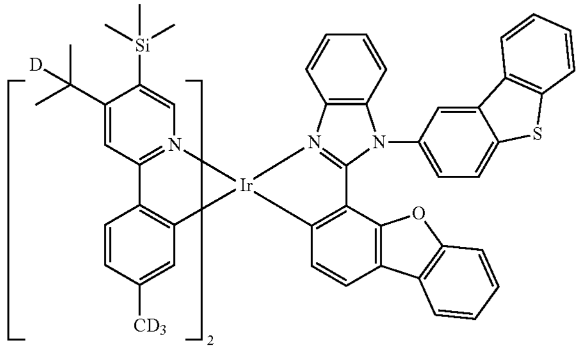
2015
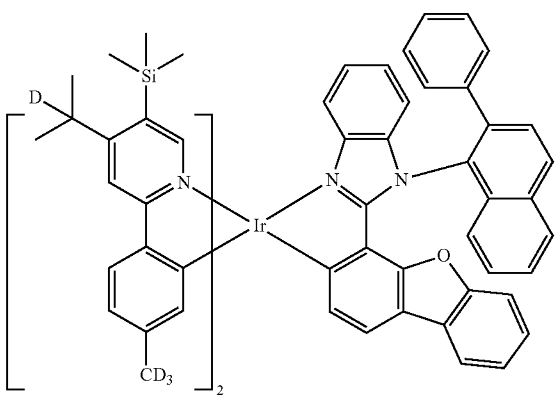
2016
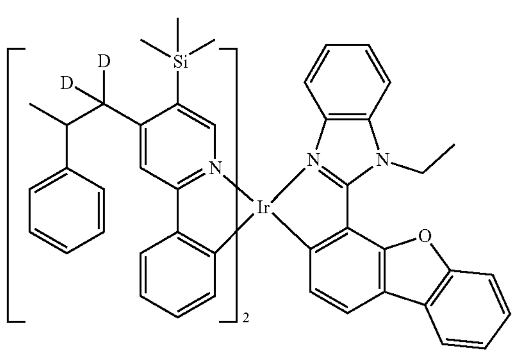
-continued
2017
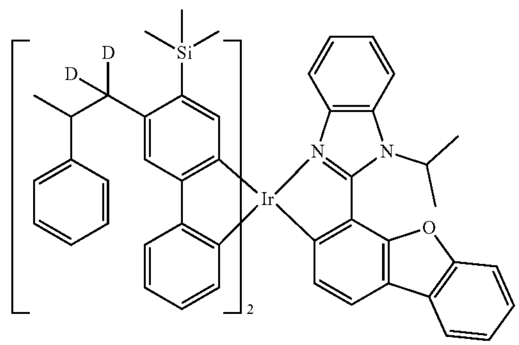
2018
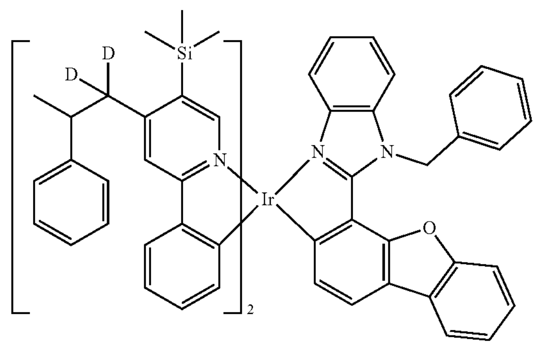
2019
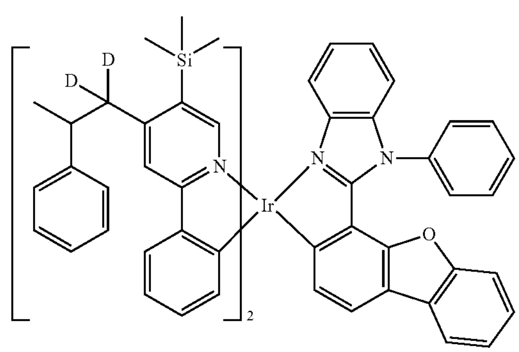
2020
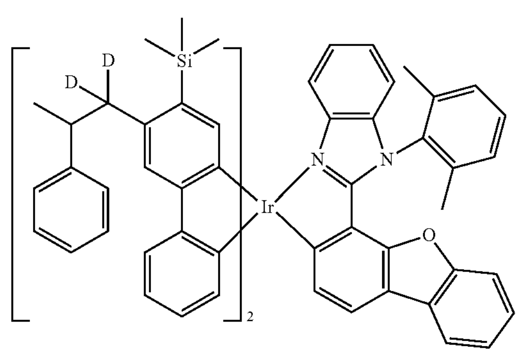

-continued
2021
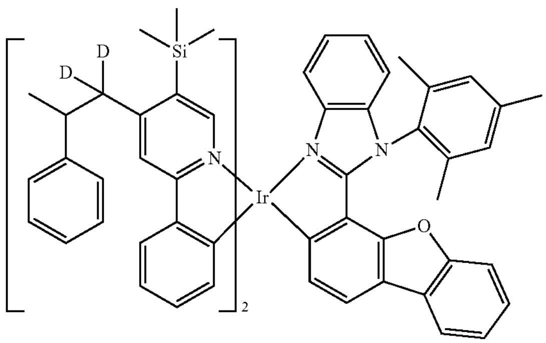
2022
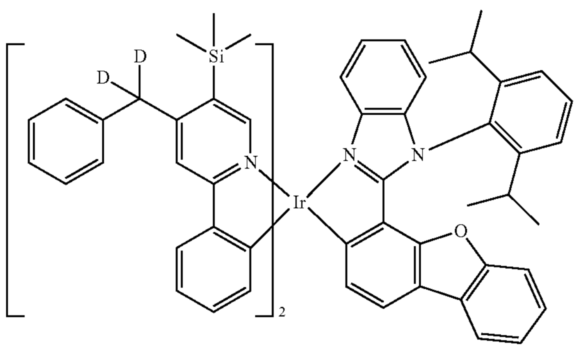
2023
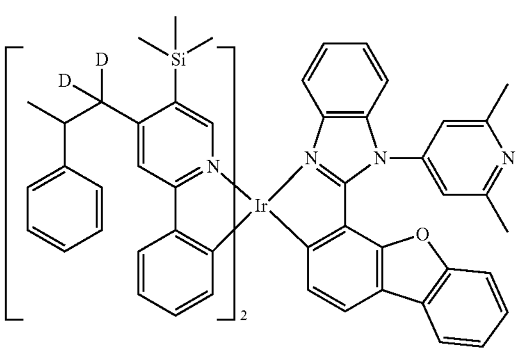
2024
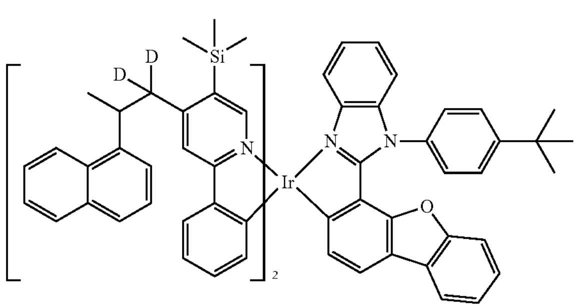
-continued
2025
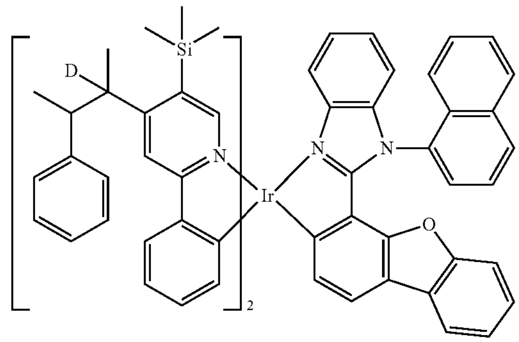
2026
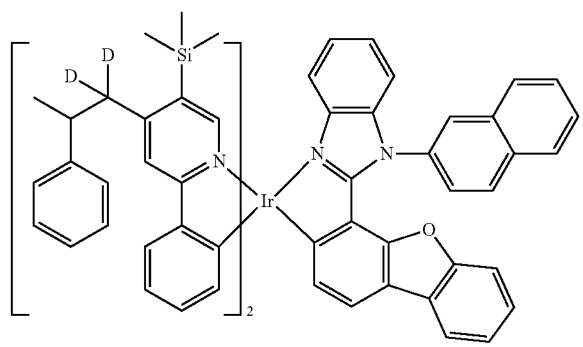
2027
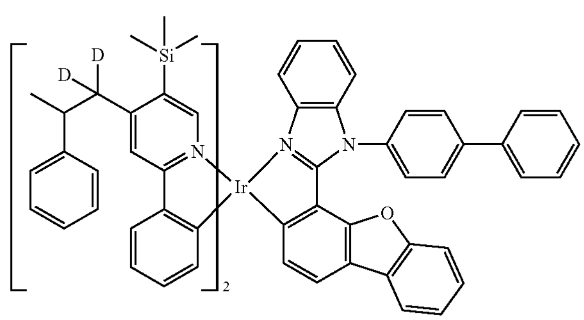
2028
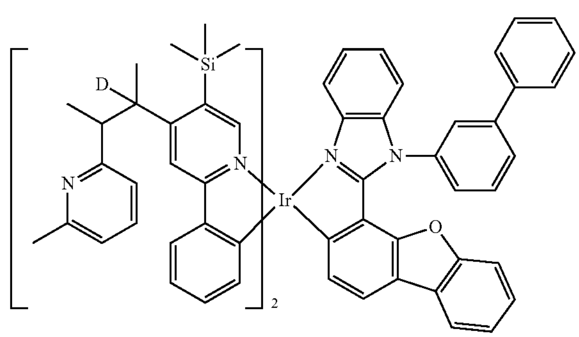

2029
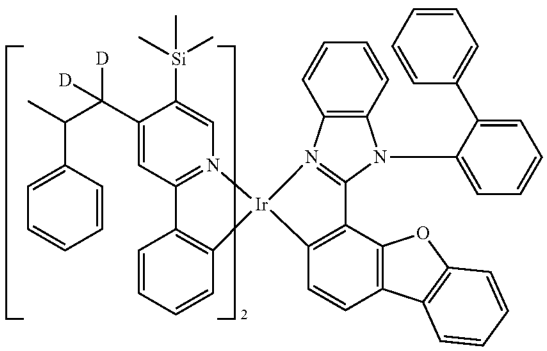
2030
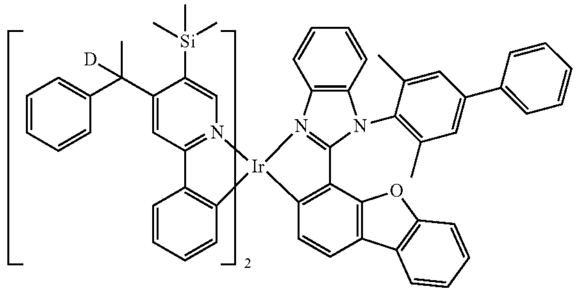
2031
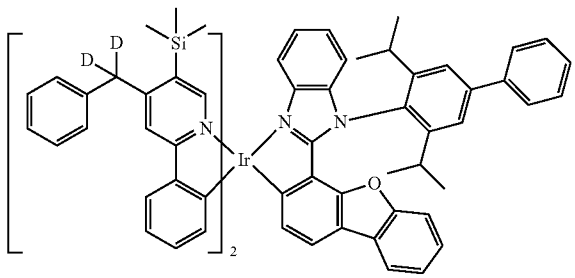
2032
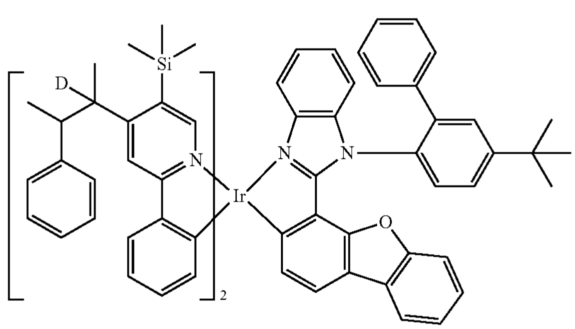
2033
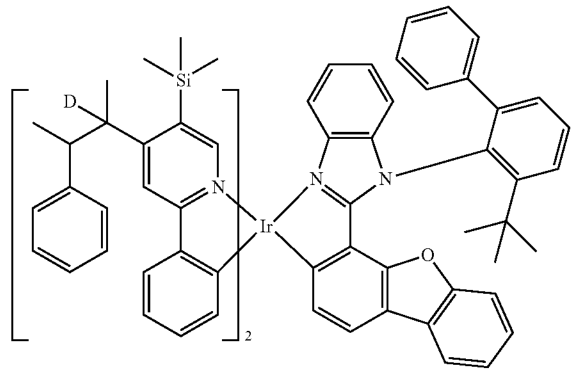
2034
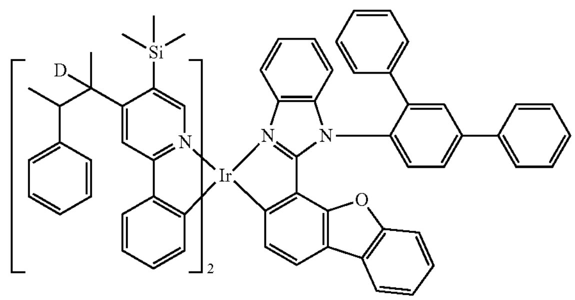
2035
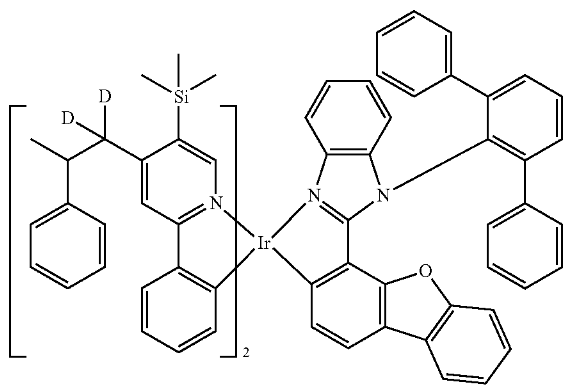
2036
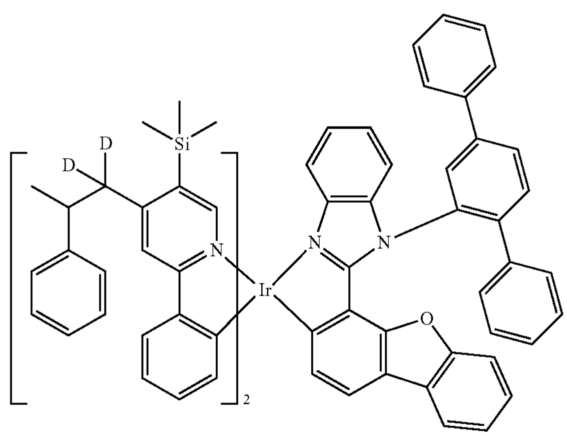

2037
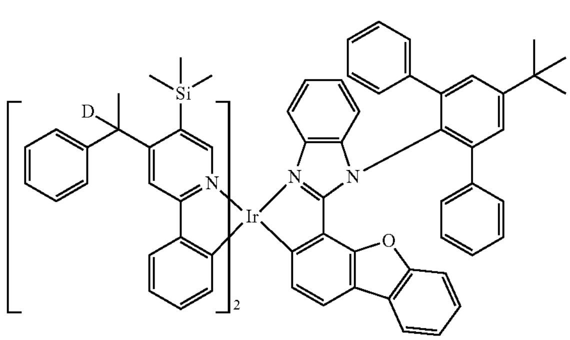
2038
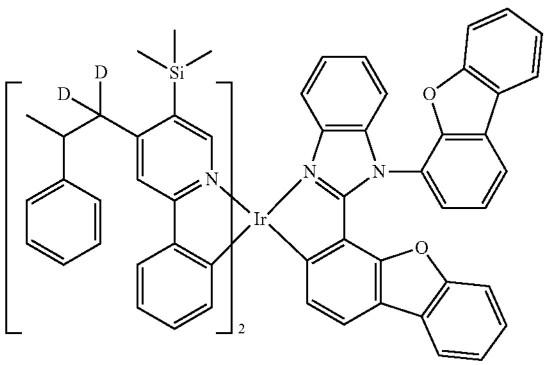
2039
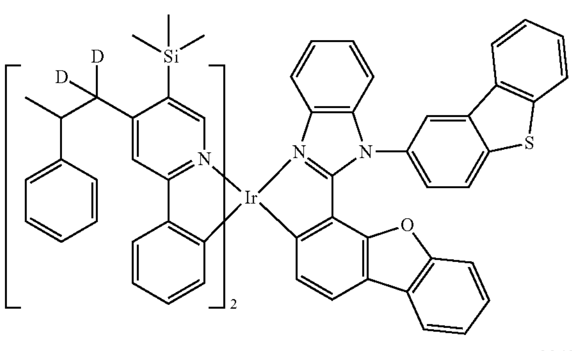
2040
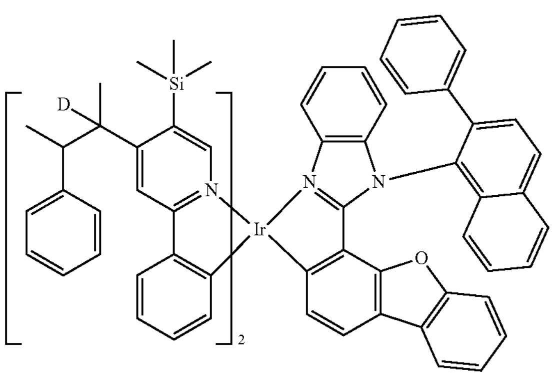
2041
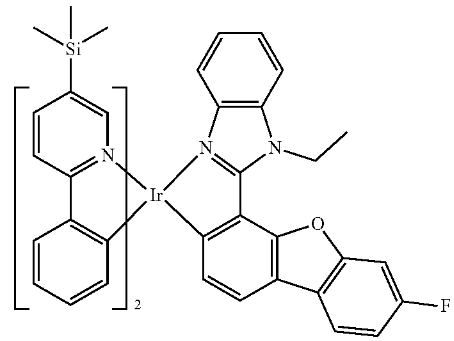
2042
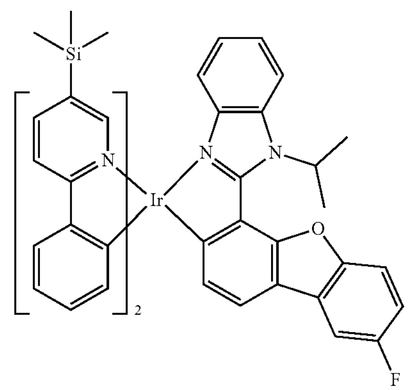
2043
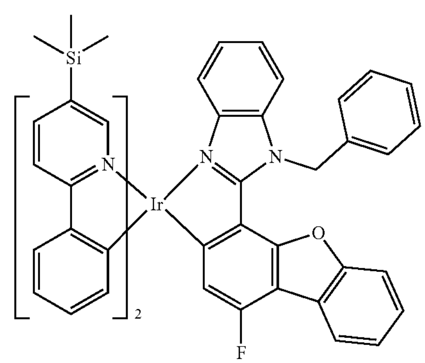
2044
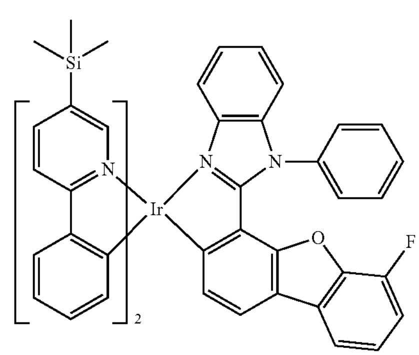

2045
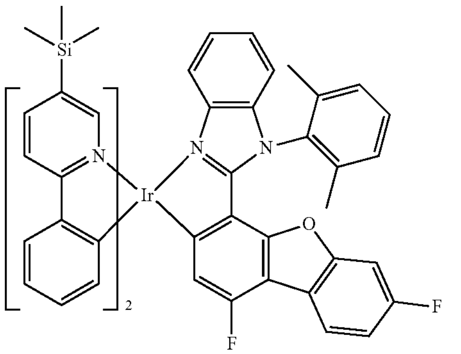
2046
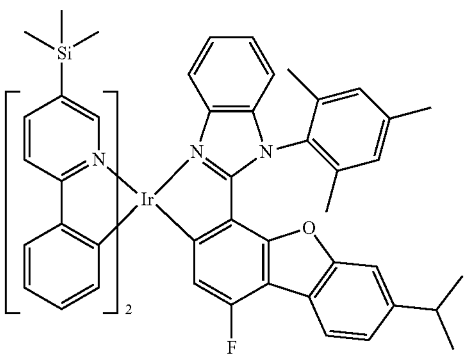
2047
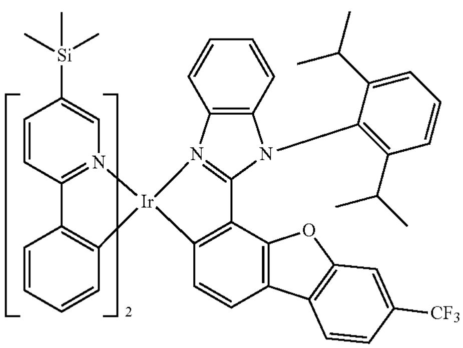
2048
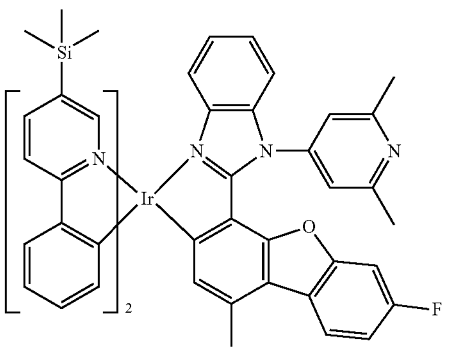
2049
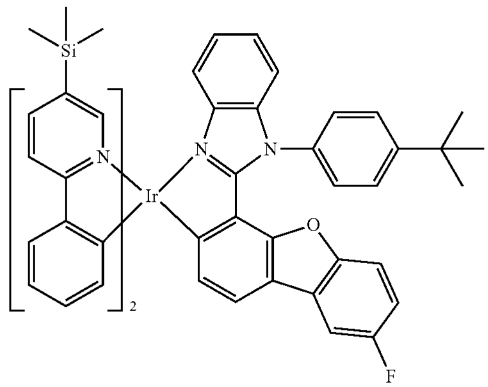
2050
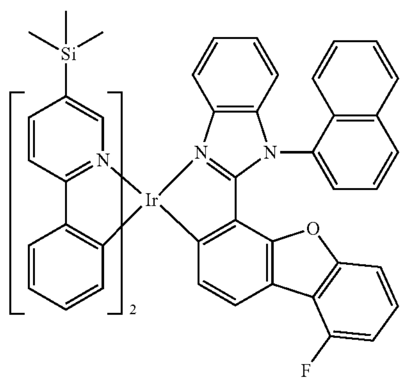
2051
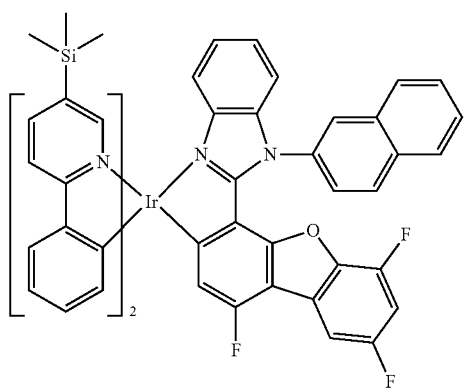
2052
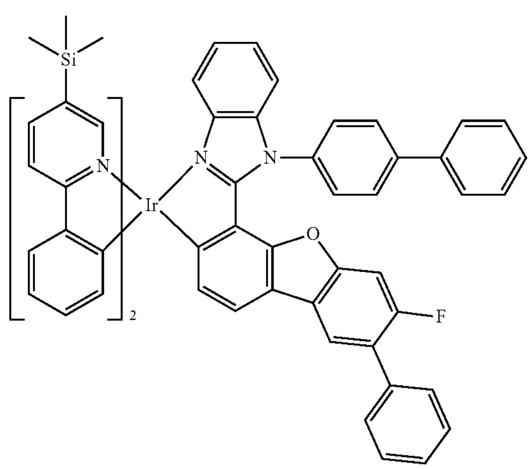

-continued
2053
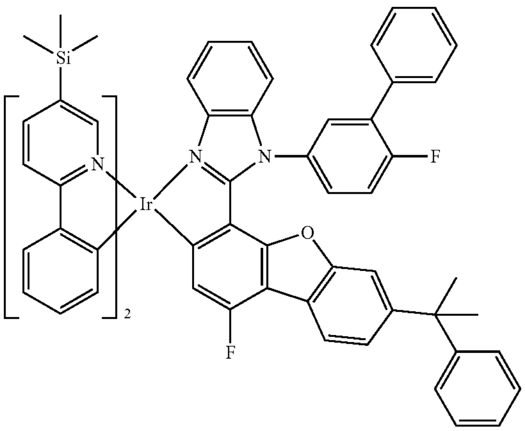
2054
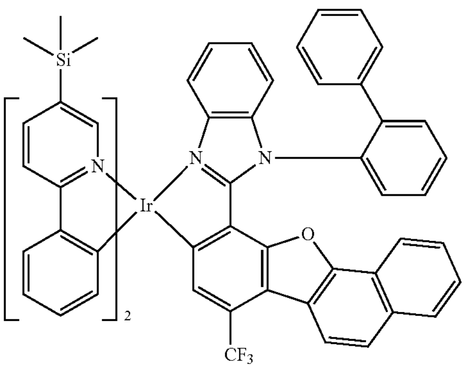
2055
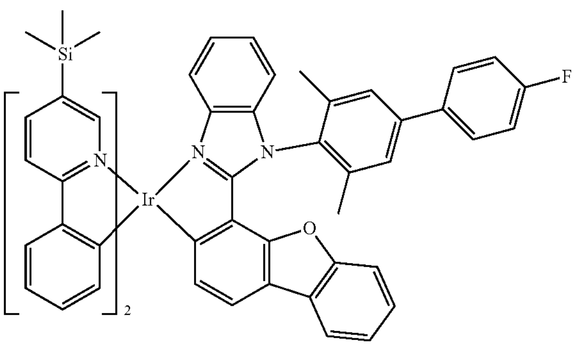
2056
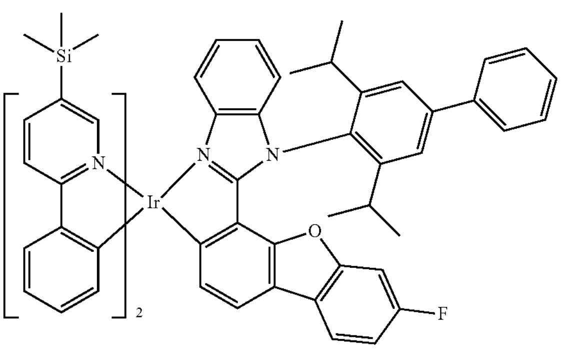
-continued
2057
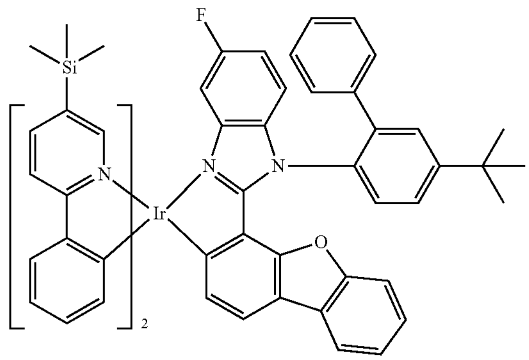
2058
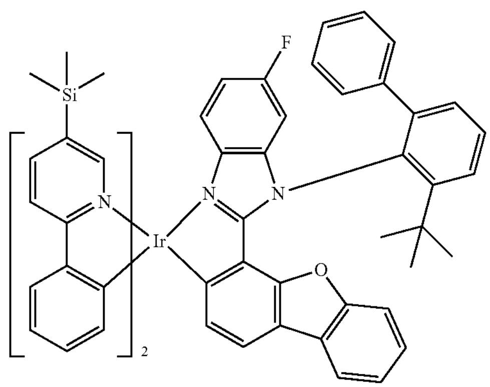
2059
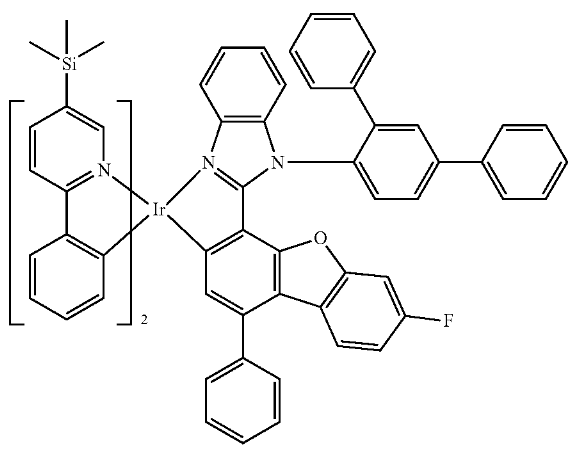
2060
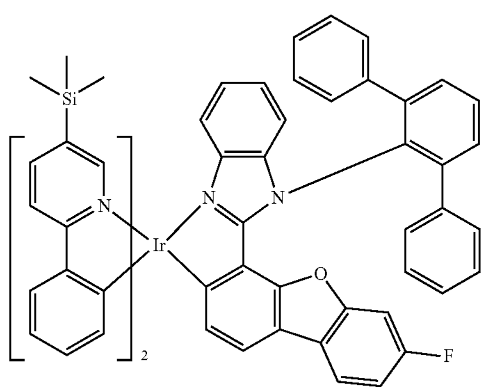

2061
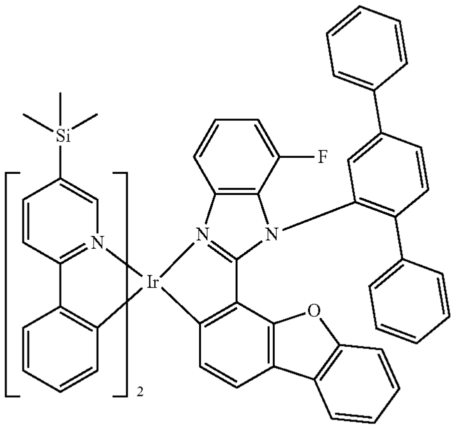
2062
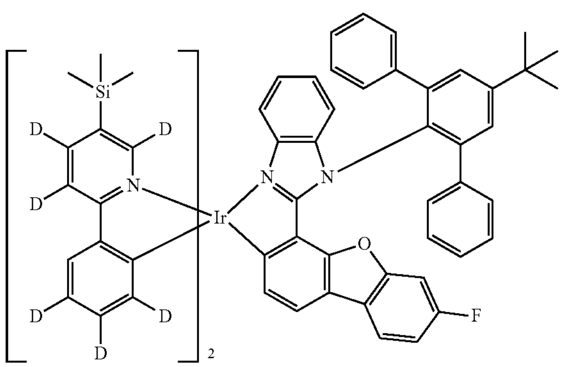
2063
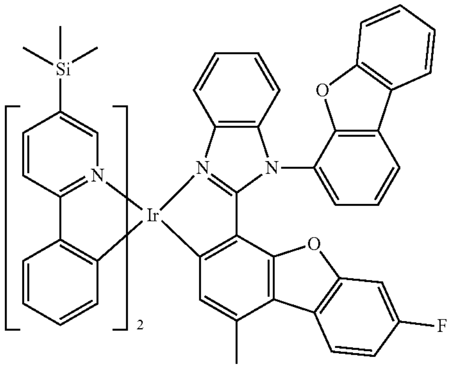
2064
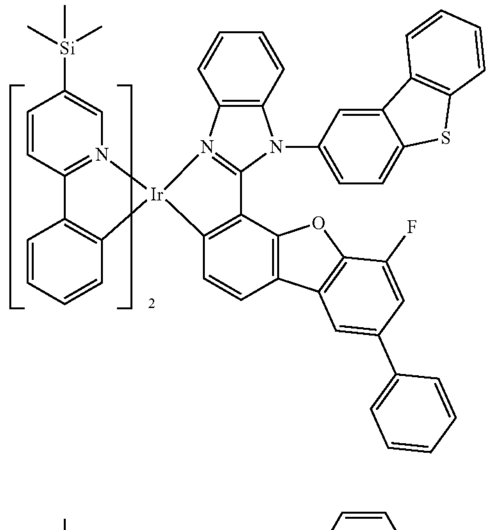
2065
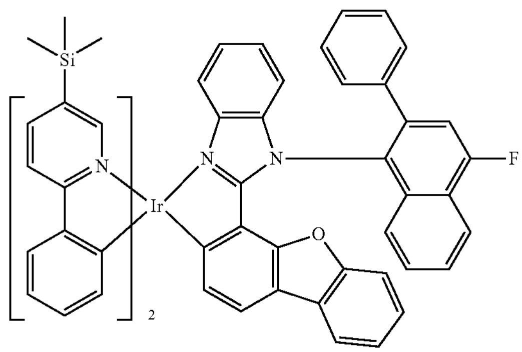
2066
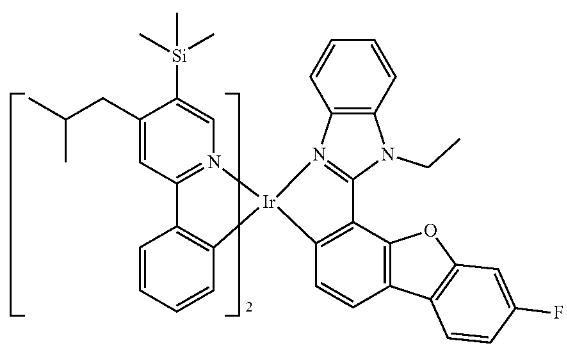
2067
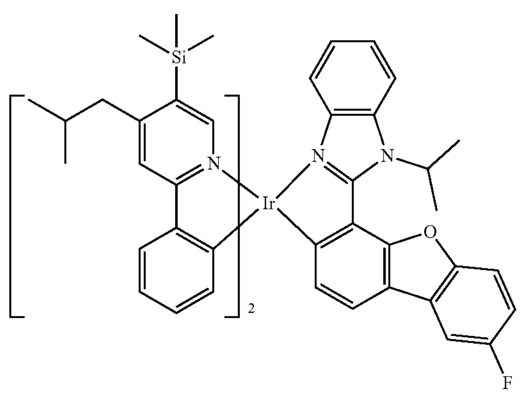

-continued
2068
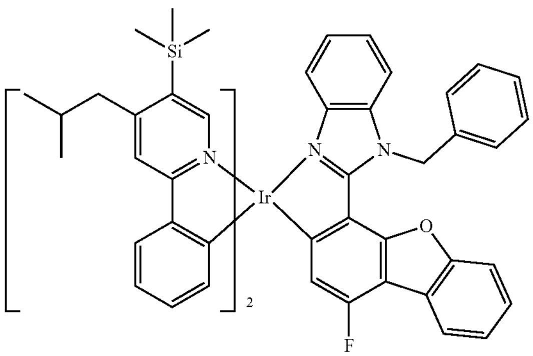
2069
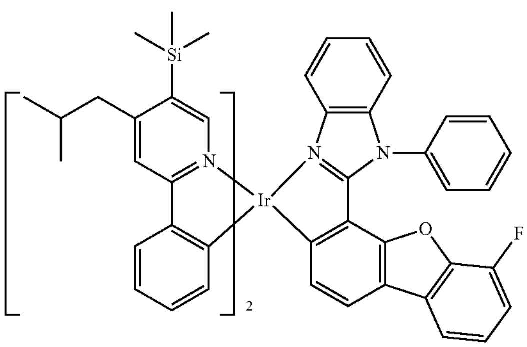
2070
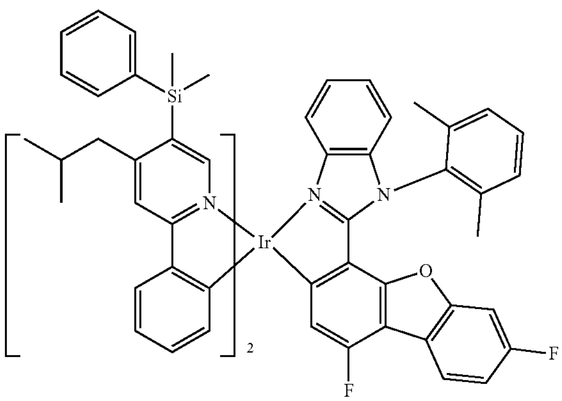
2071
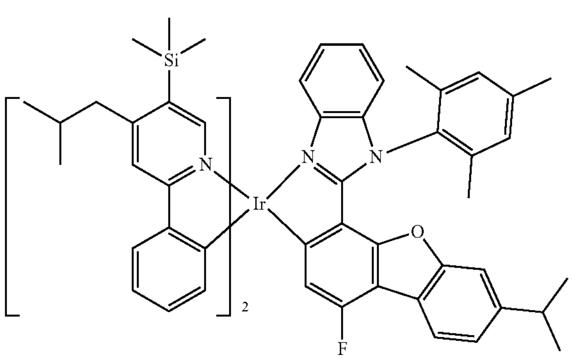
-continued
2072
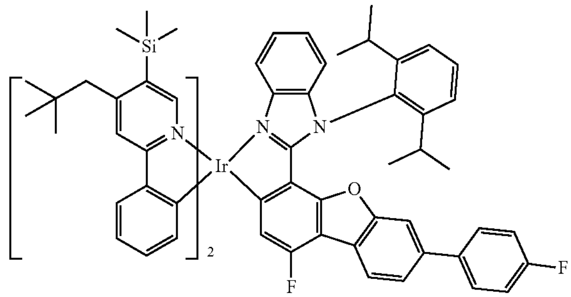
2073
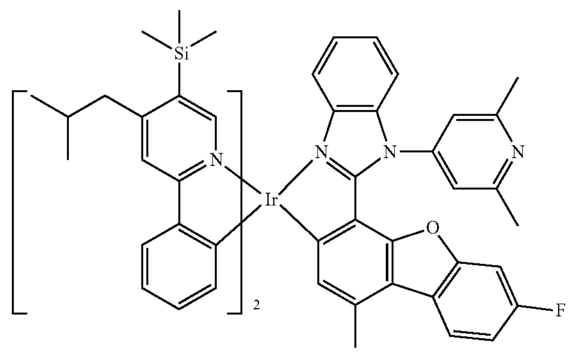
2074
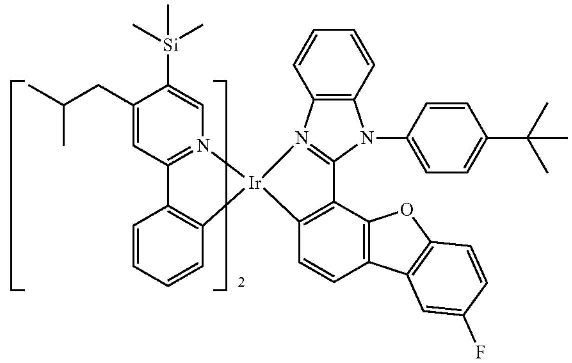
2075
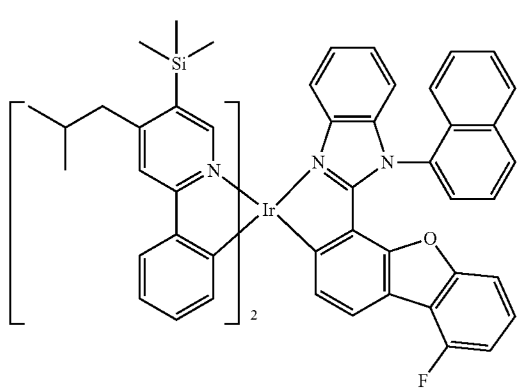

2076
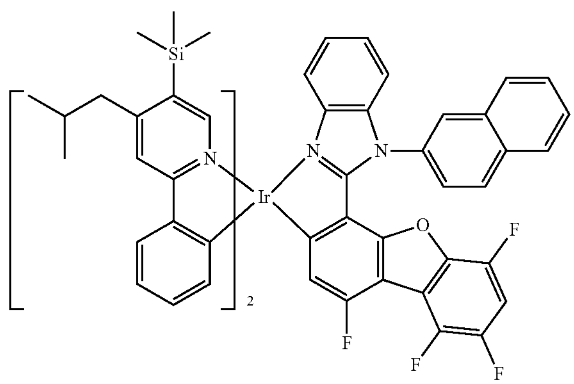
2077
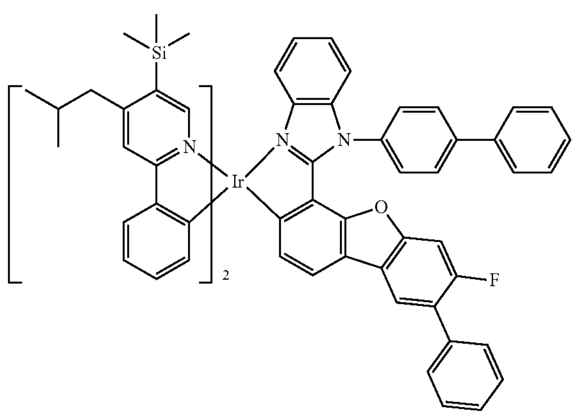
2078
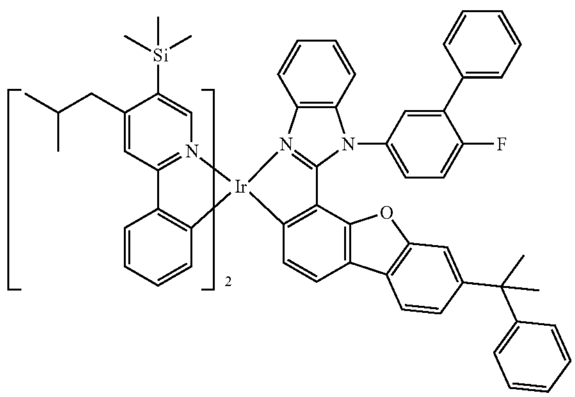
2079
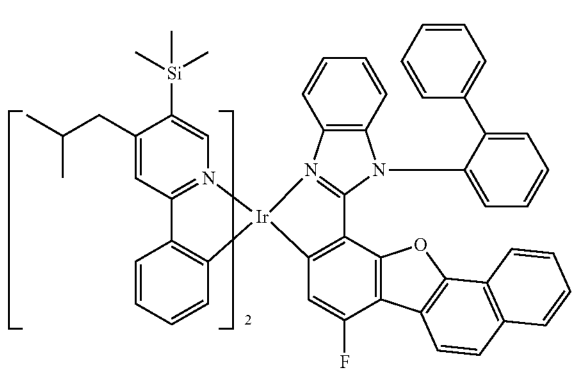
2080
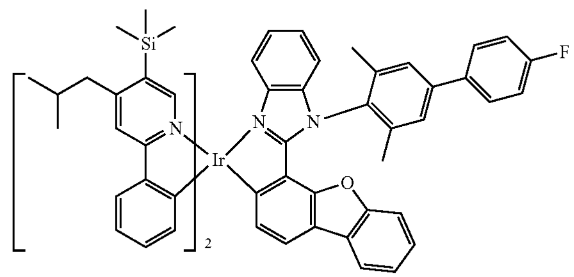
2081
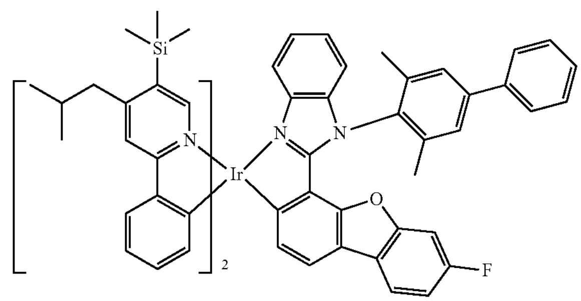
2082
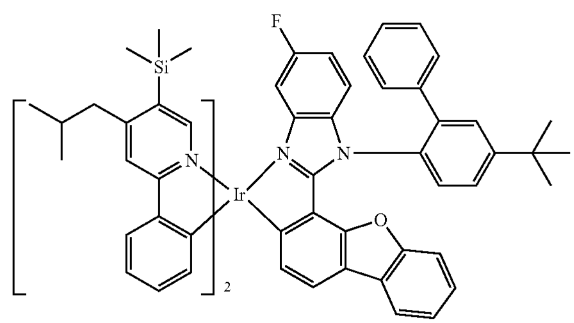
2083
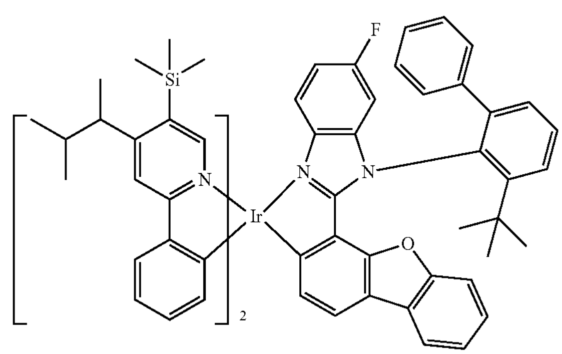

2084
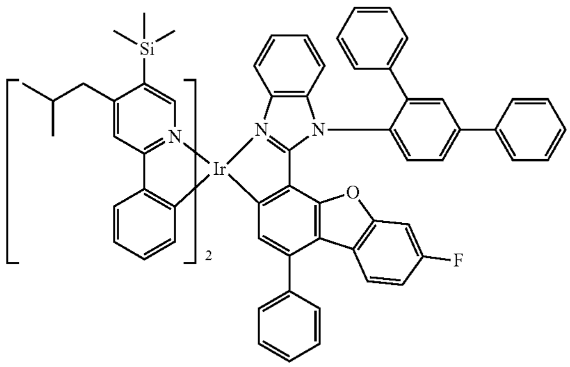
2085
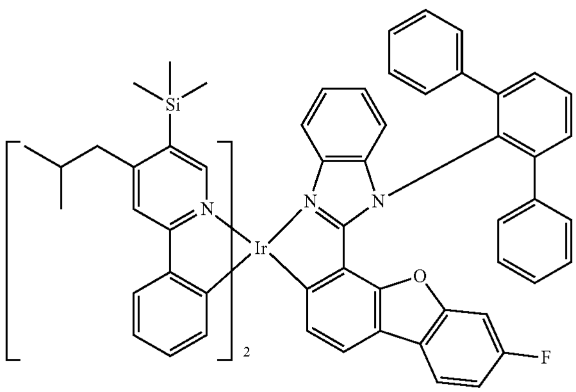
2086
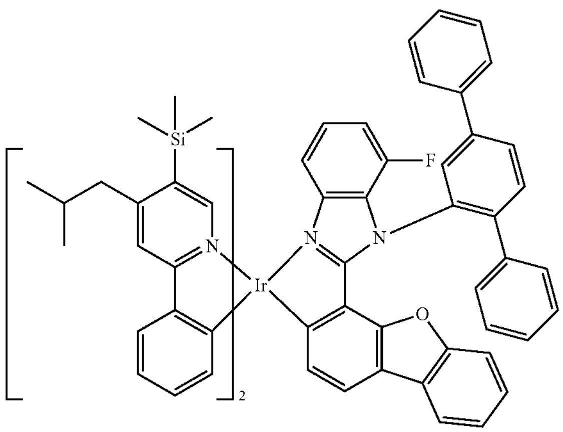
2087
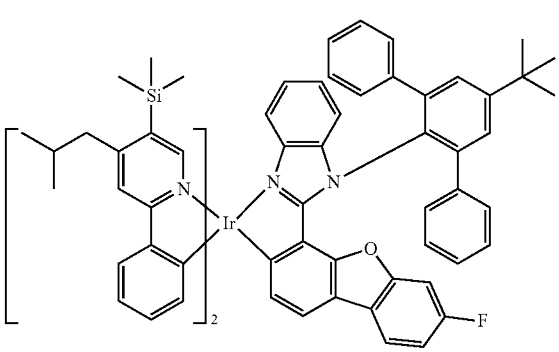
2088
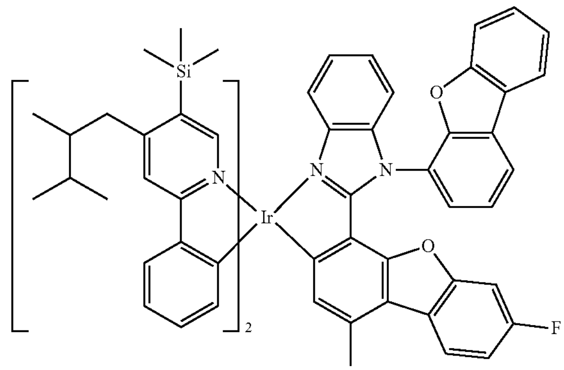
2089
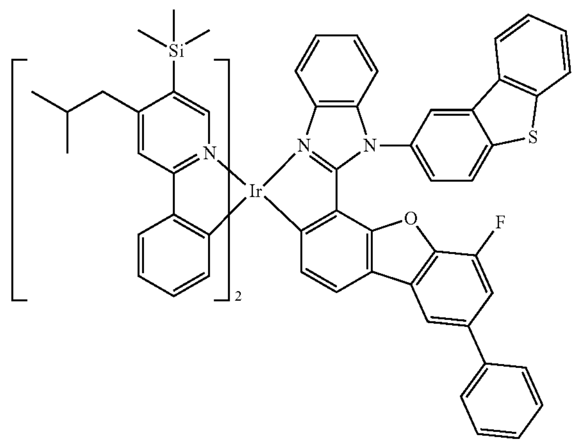
2090
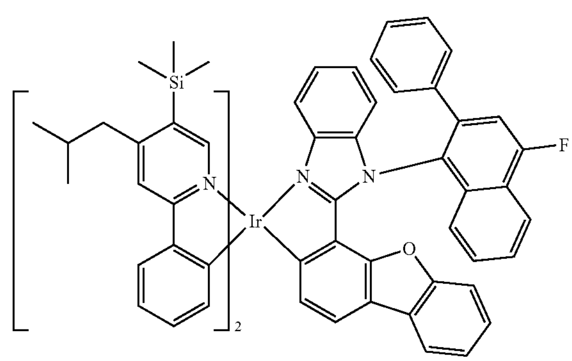

-continued
2091
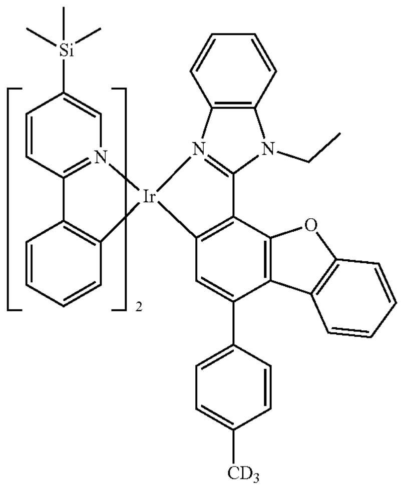
2092
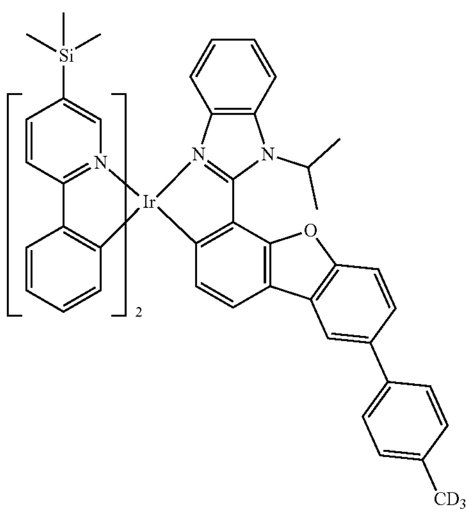
2093
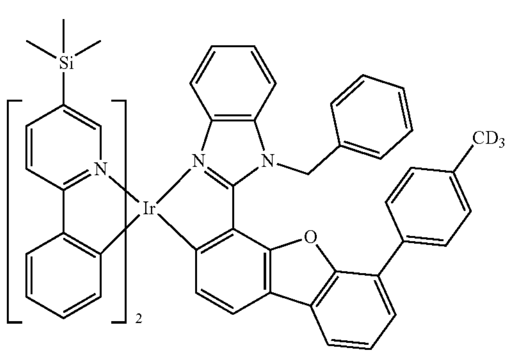
-continued
2094
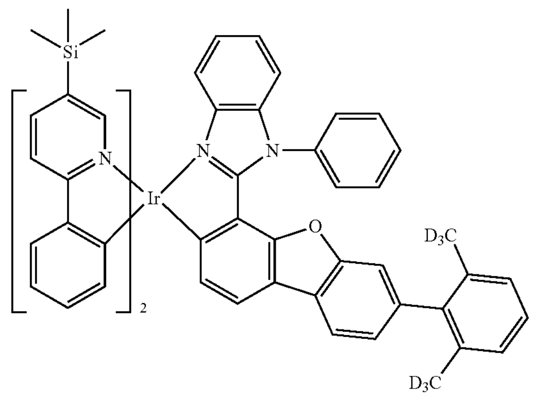
2095
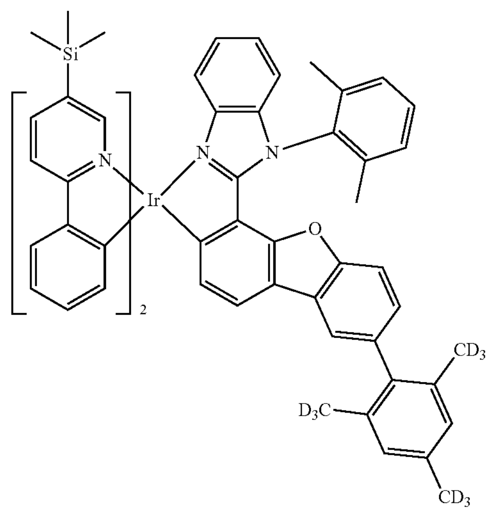
2096
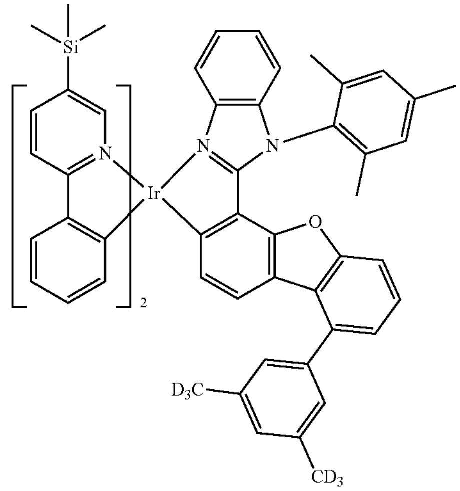

-continued
2097
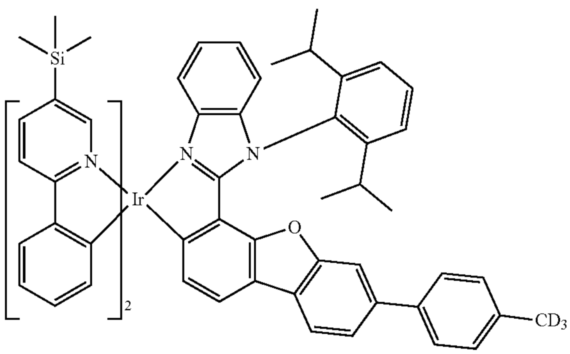
2098
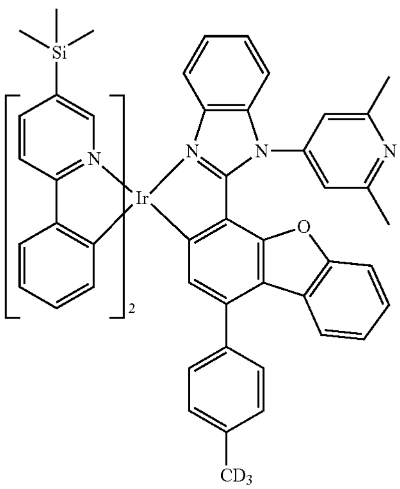
2099
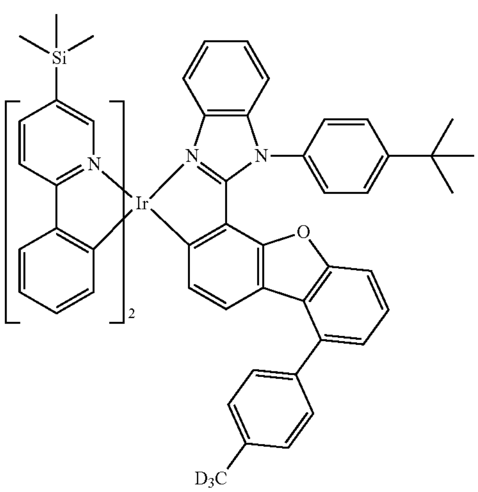
-continued
2100
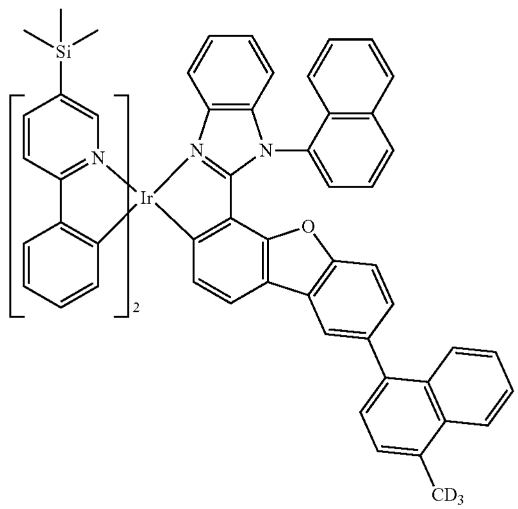
2101
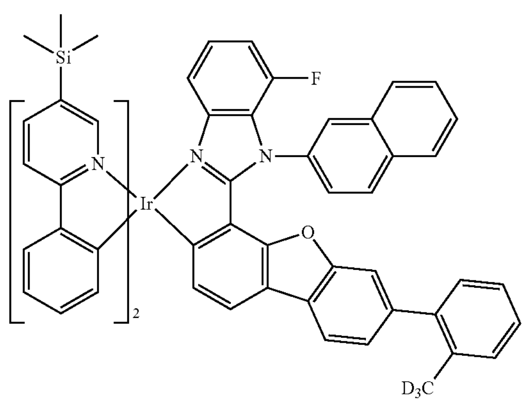
2102
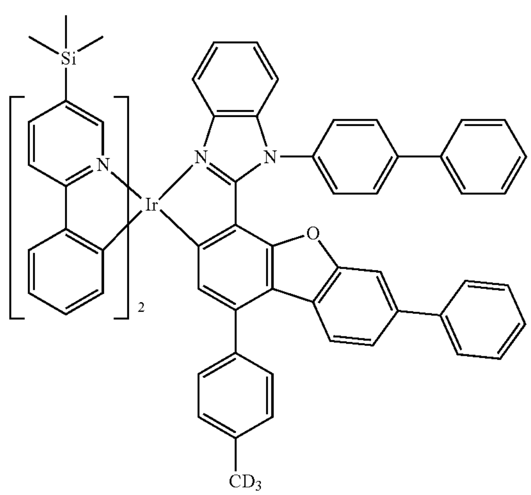

2103
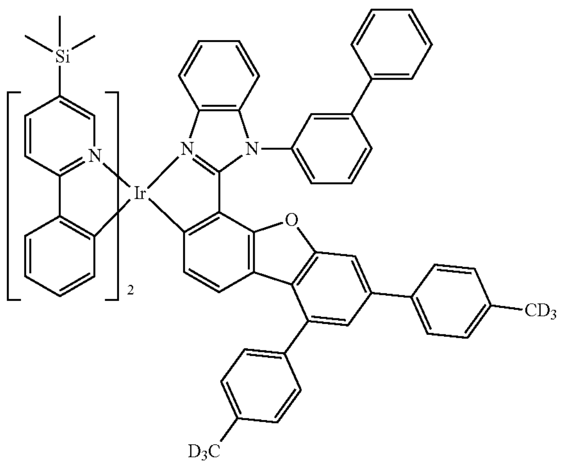
2104
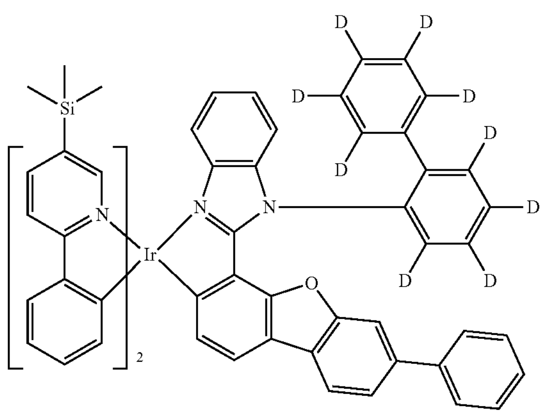
2105
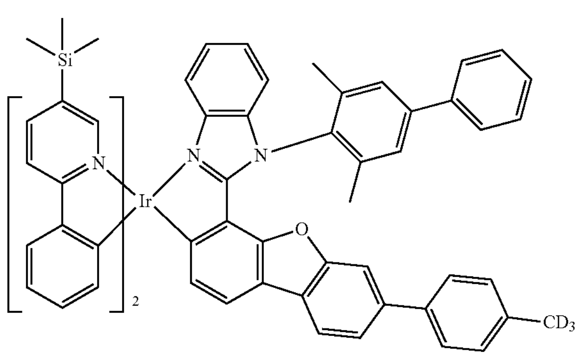
2106
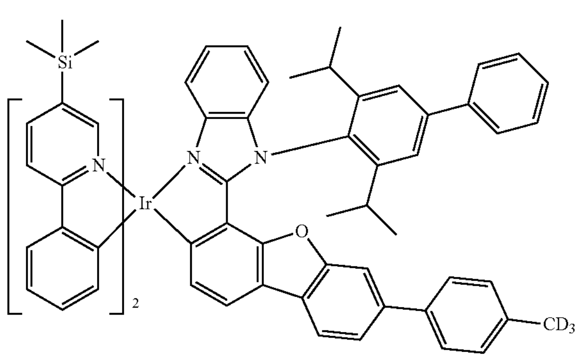
2107
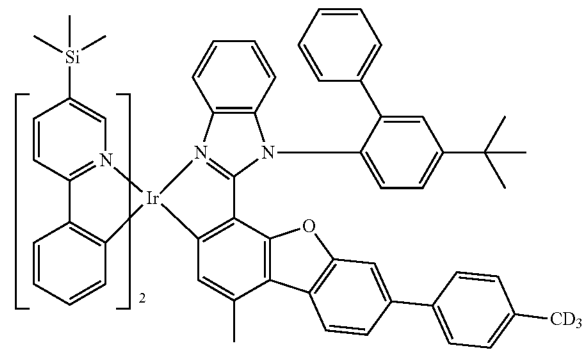
2108
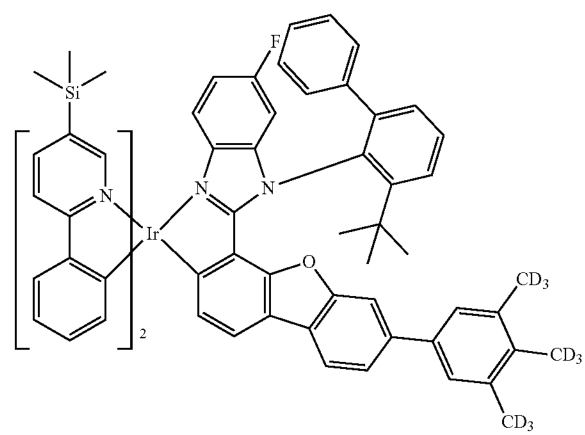
2109
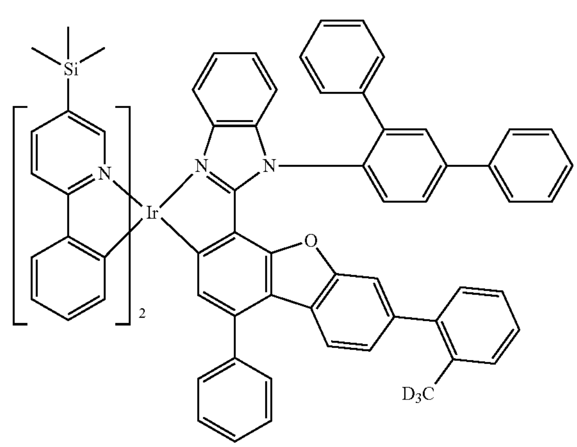

-continued
2110
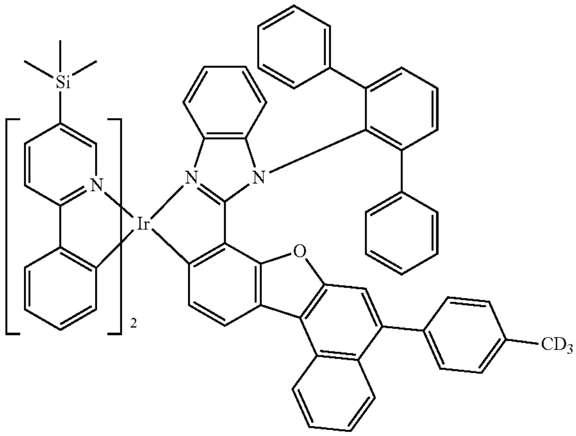
2111
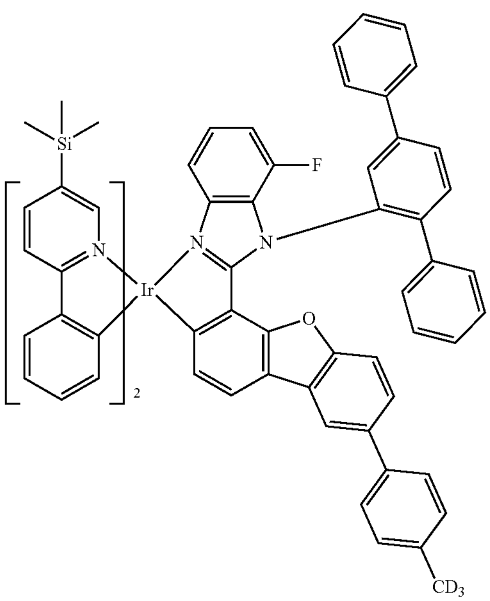
2112
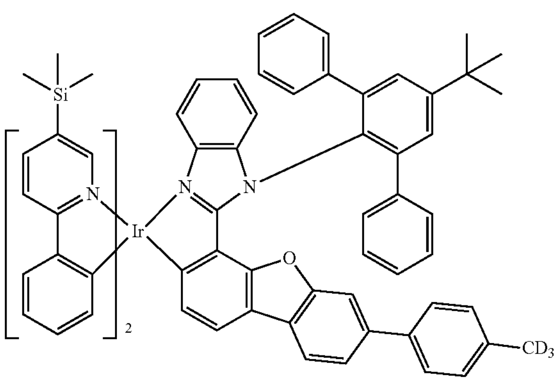
-continued
2113
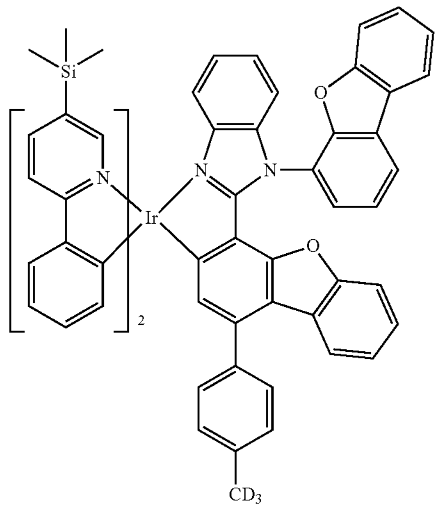
2114
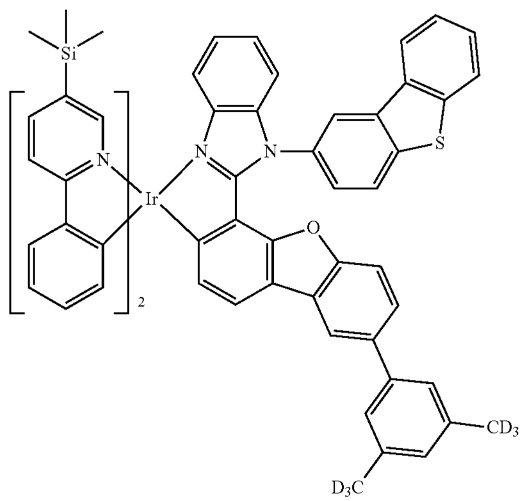
2115
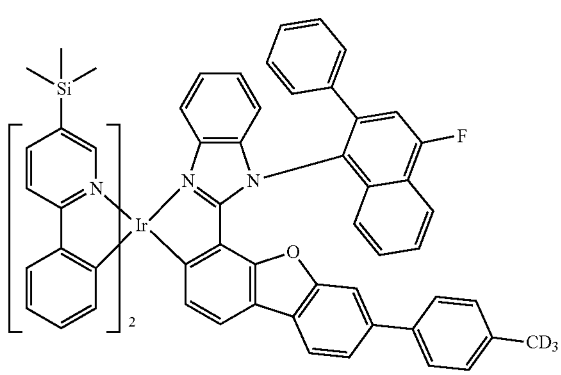

-continued
2116
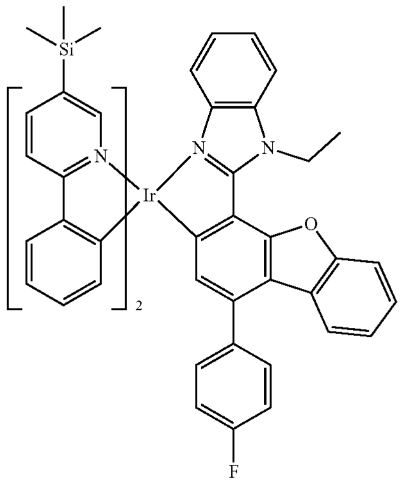
2117
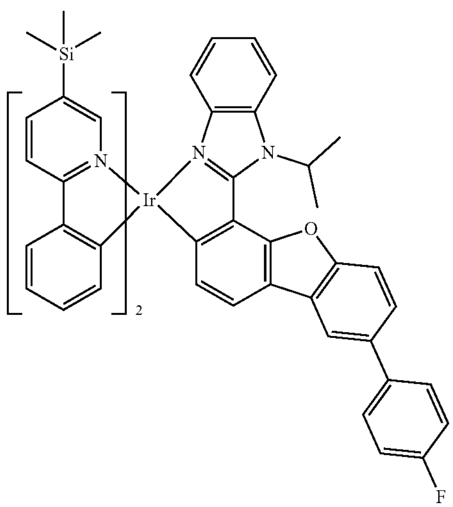
2118
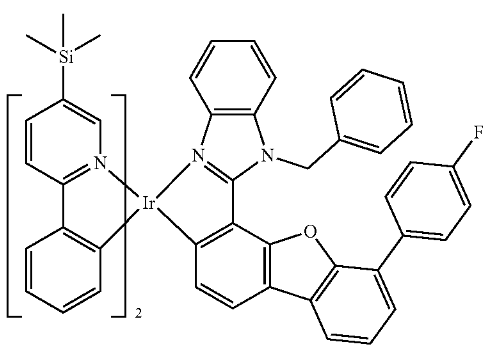
-continued
2119
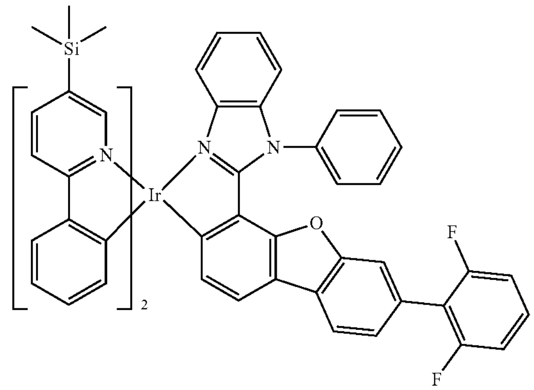
2120
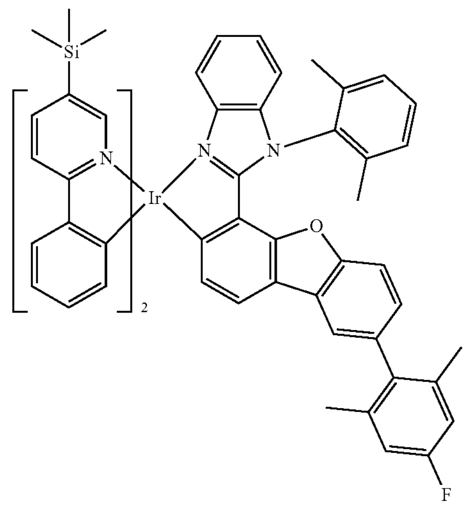
2121
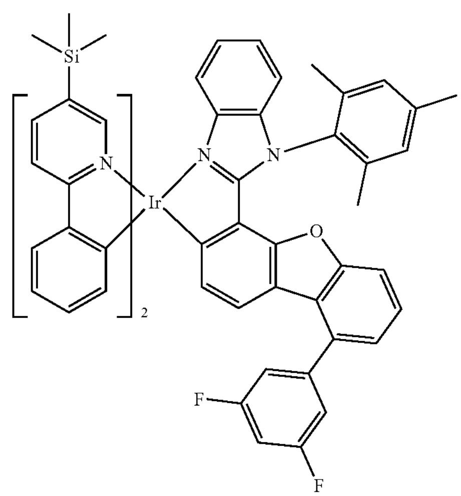

-continued
2122
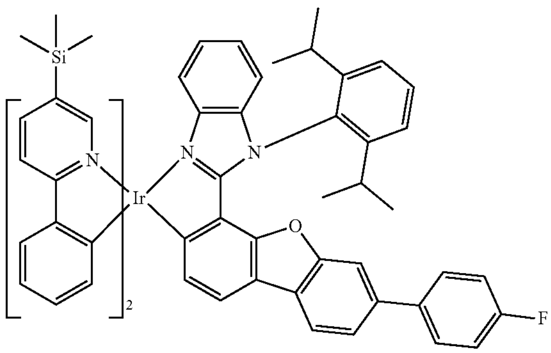
2123
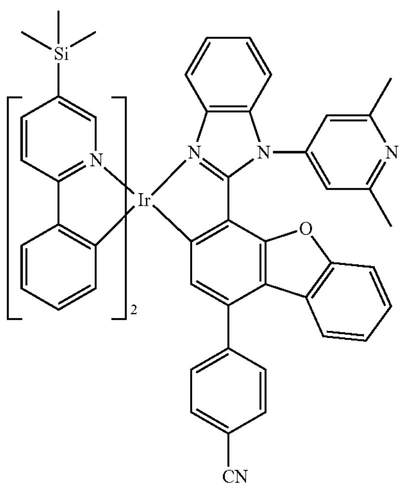
2124
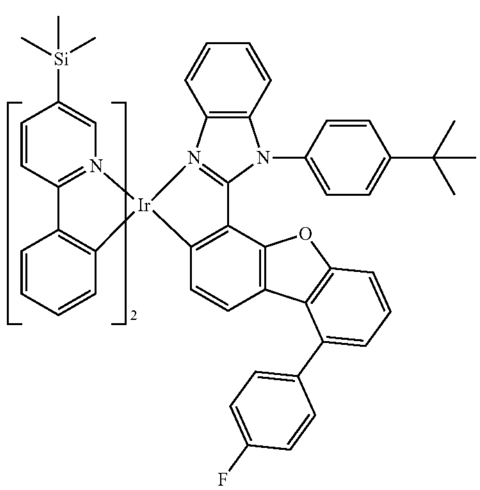
-continued
2125
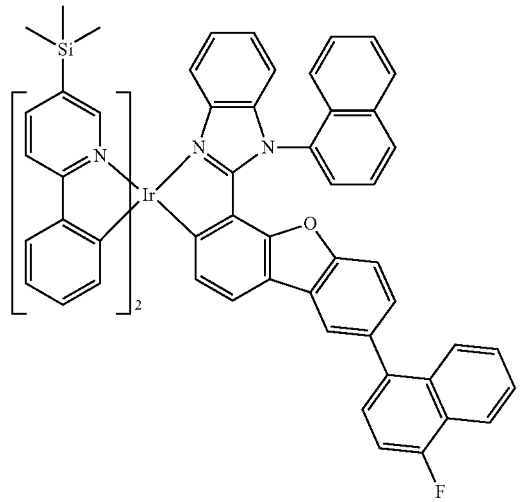
2126
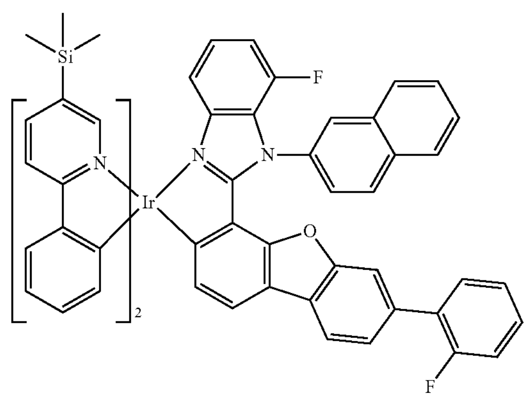
2127
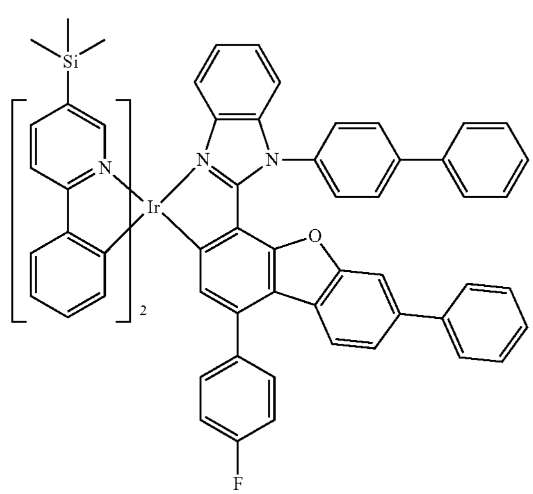

-continued
2128
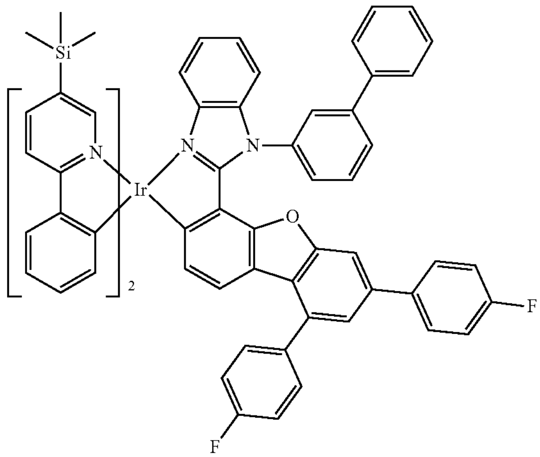
2129
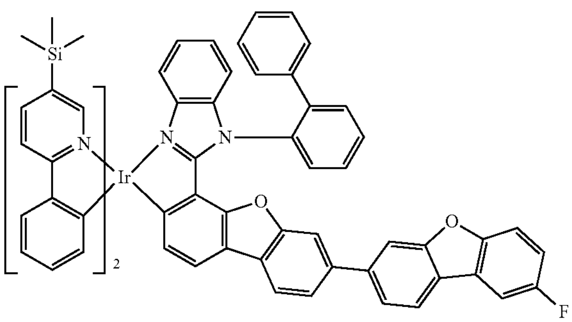
2130
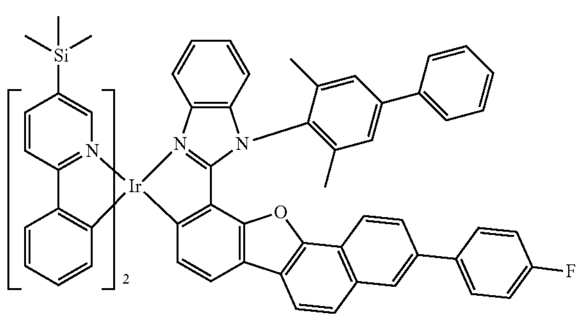
2131
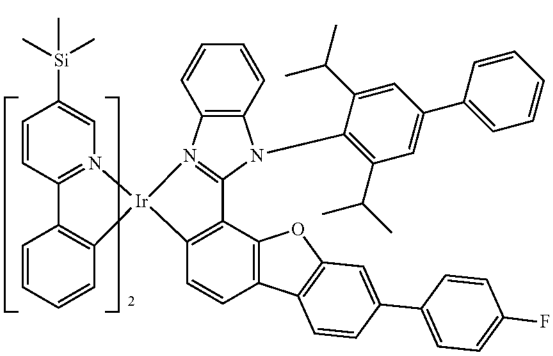
-continued
2132
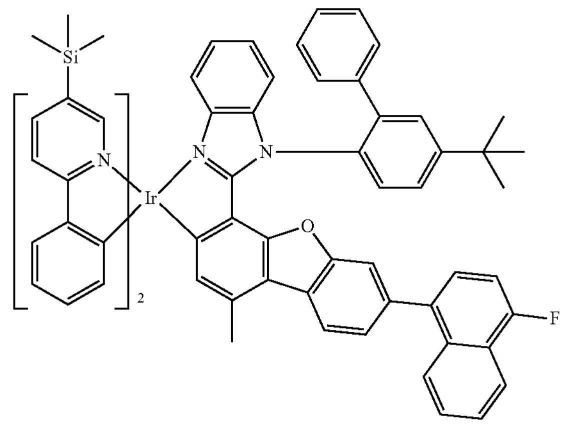
2133
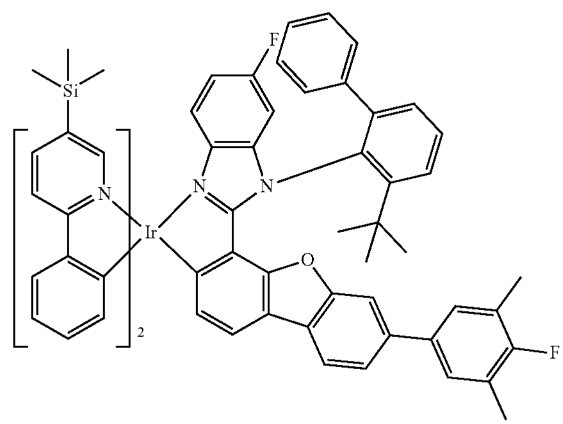
2134
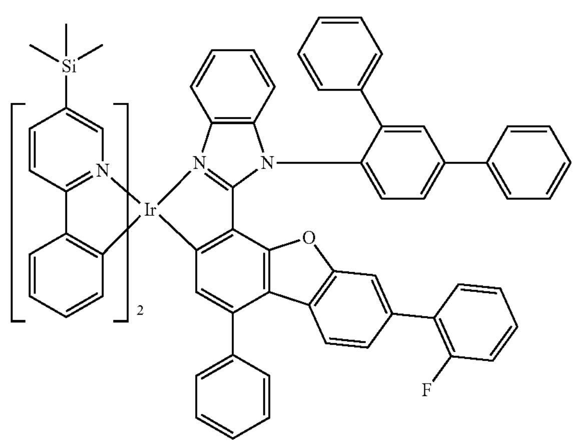

-continued
2135
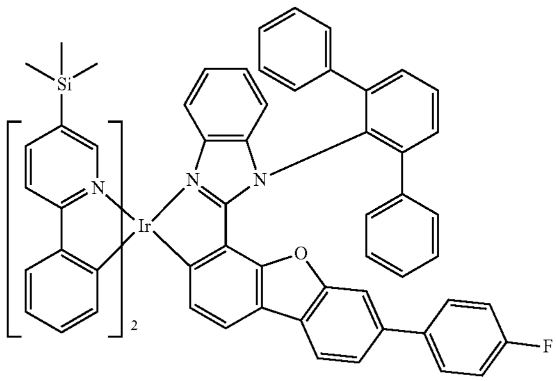
2136
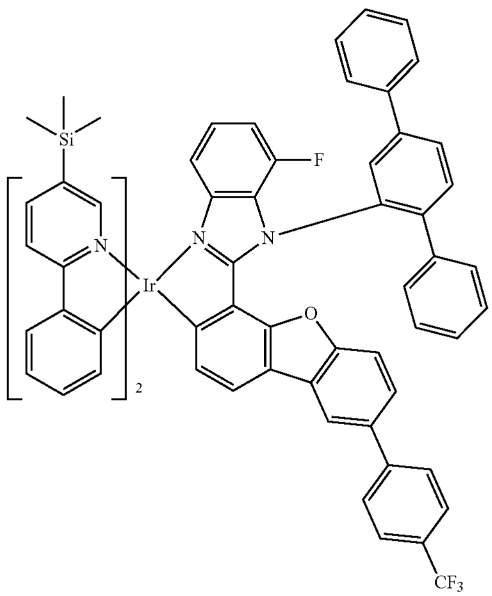
2137
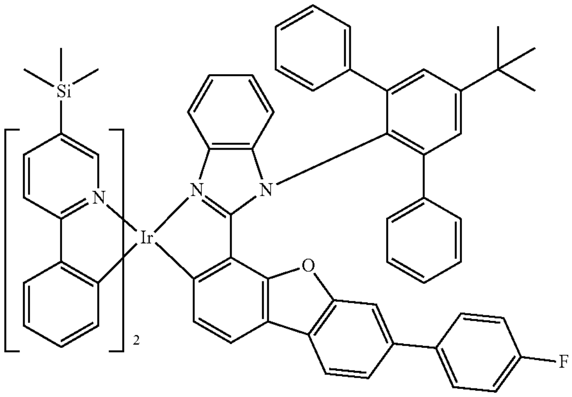
-continued
2138
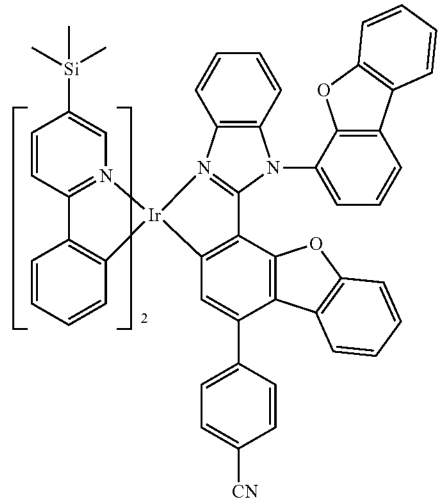
2139
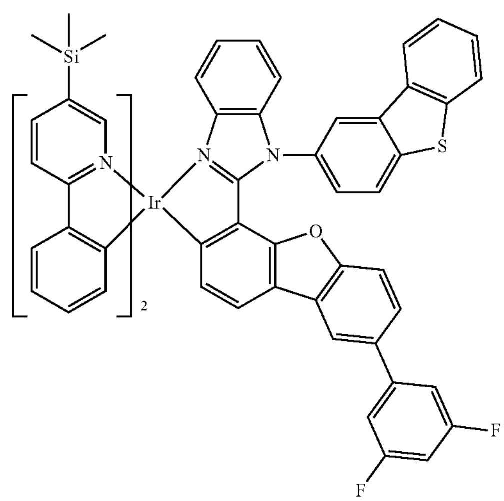
2140
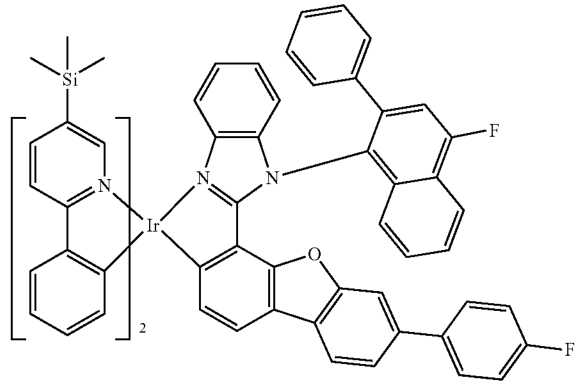

-continued
2141
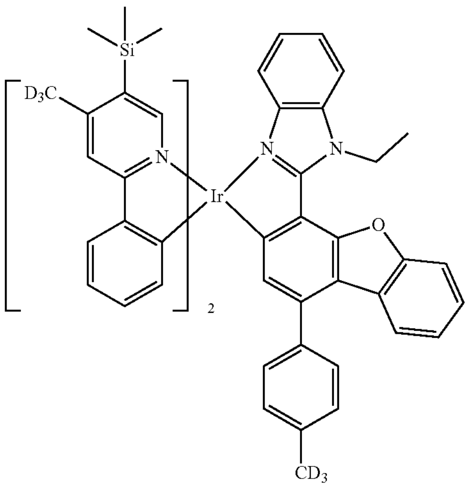
2142
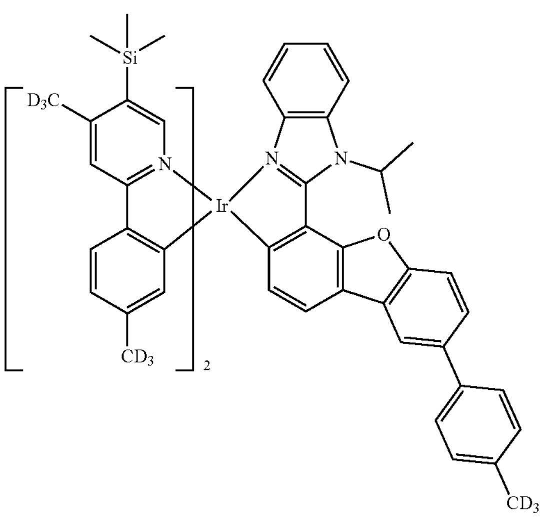
2143
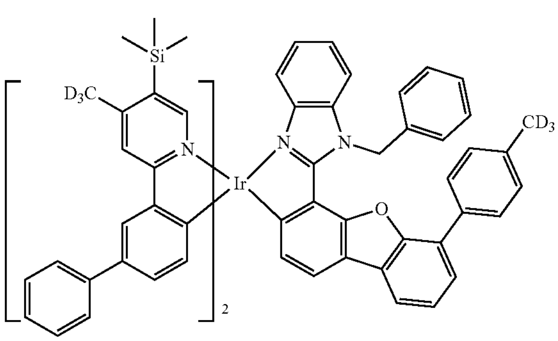
-continued
2144
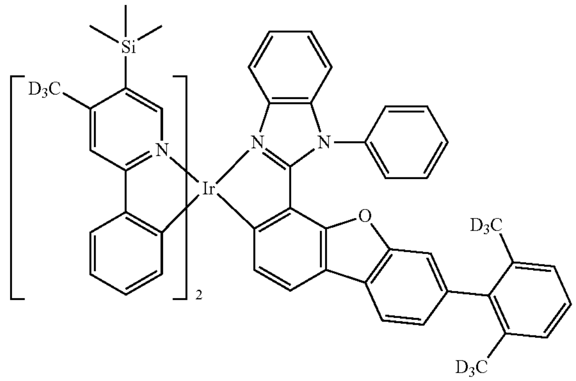
2145
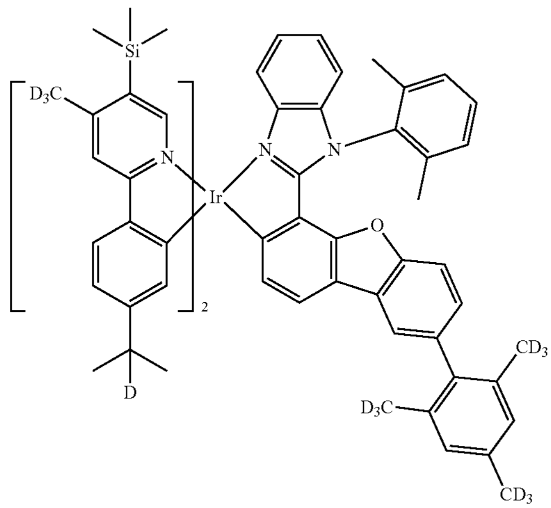
2146
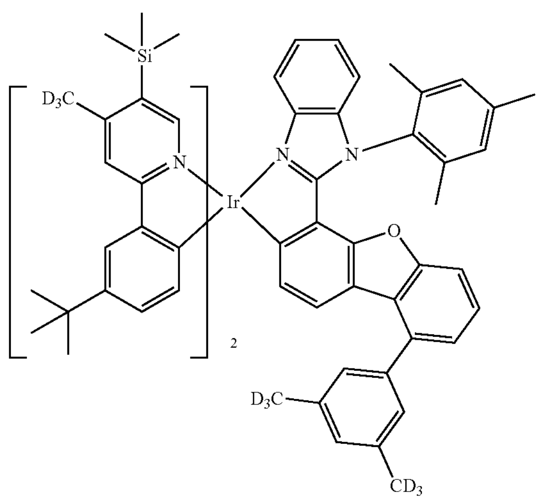

-continued
2147
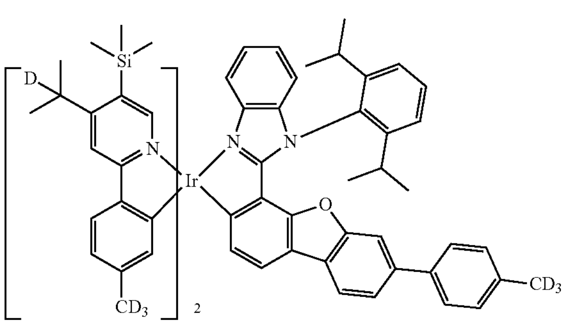
2148
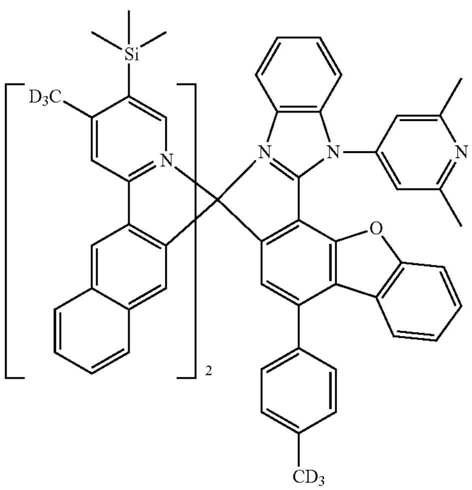
2149
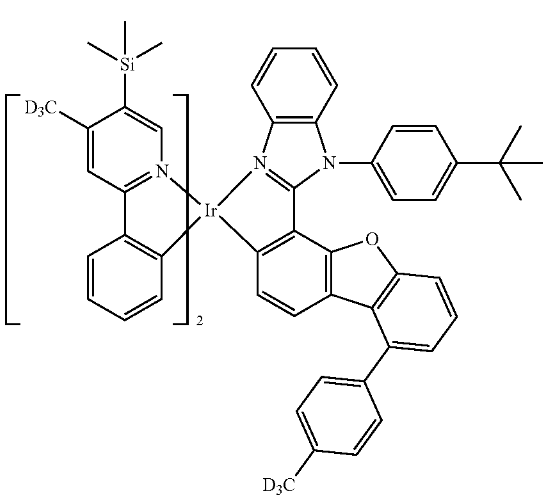
-continued
2150
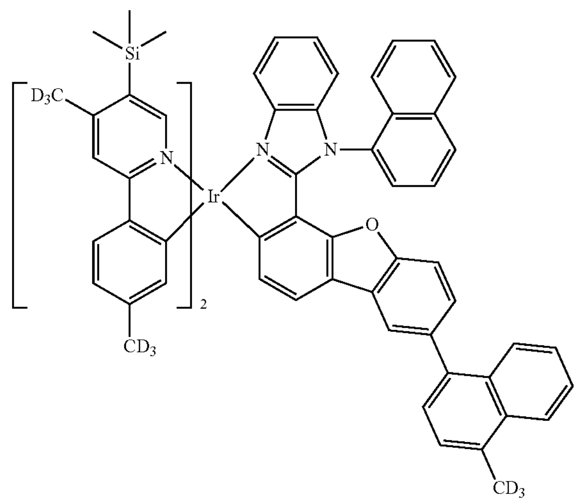
2151
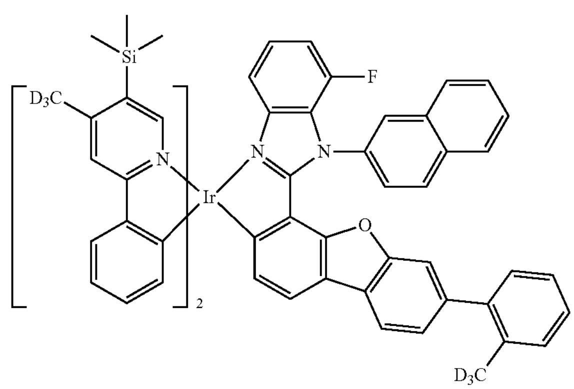
2152
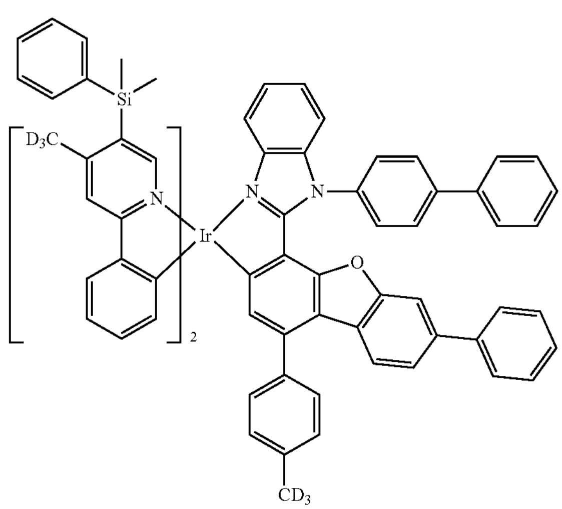

2153
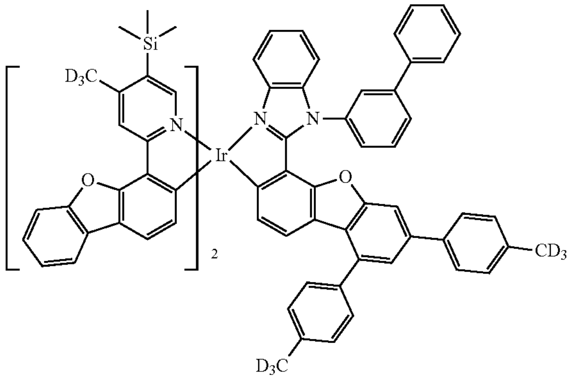
2154
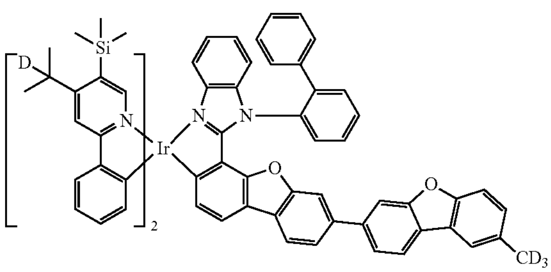
2155
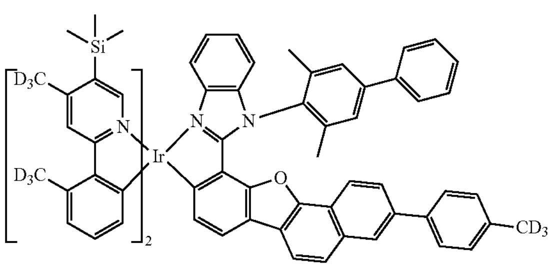
2156
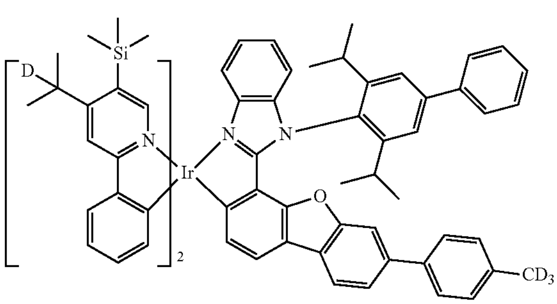
2157
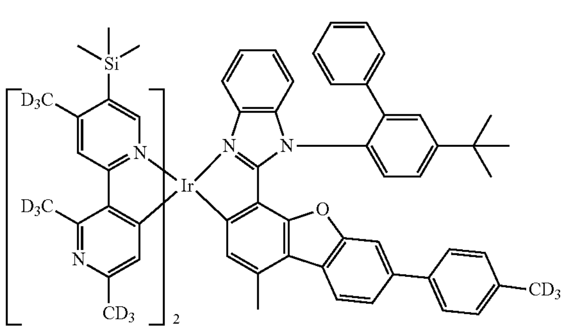
2158
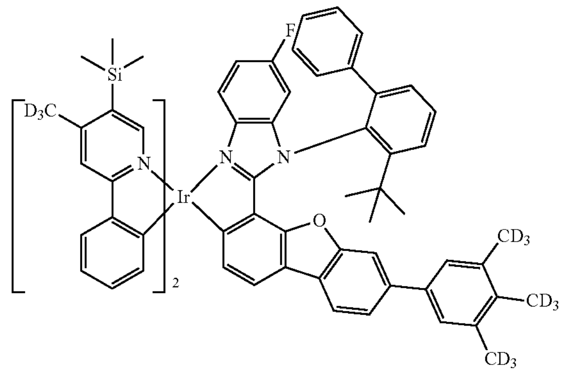
2159
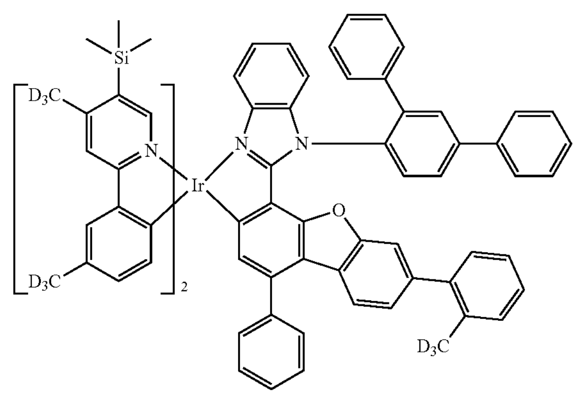
2160
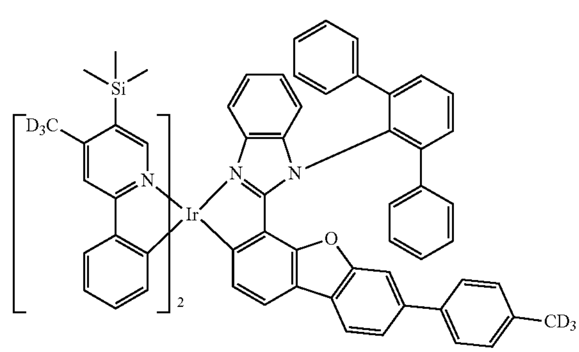

-continued
2161
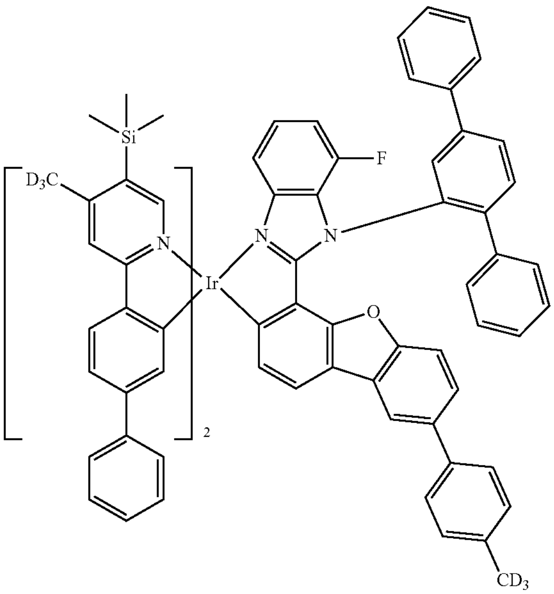
2162
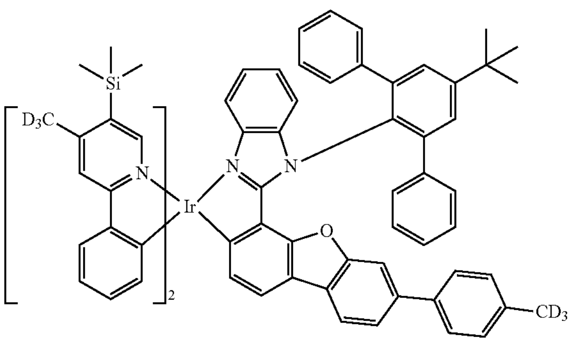
2163
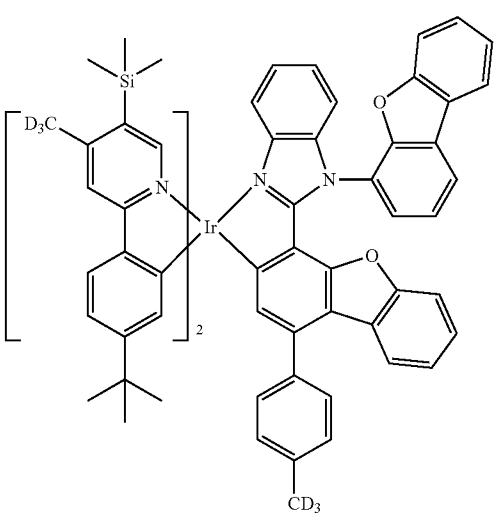
-continued
2164
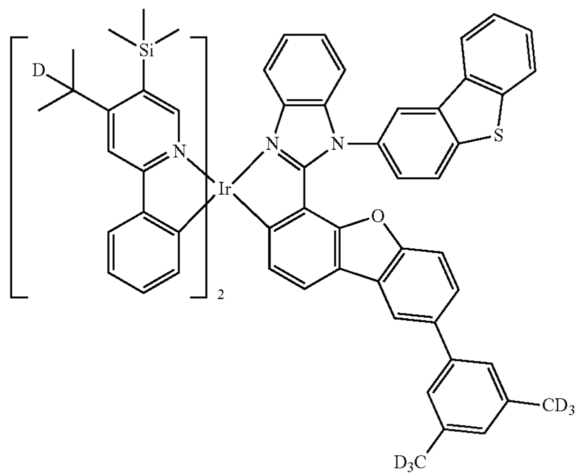
2165
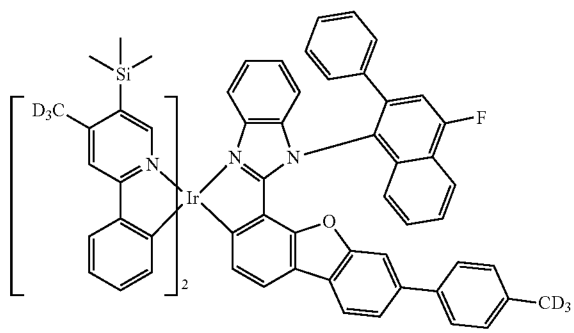
2166
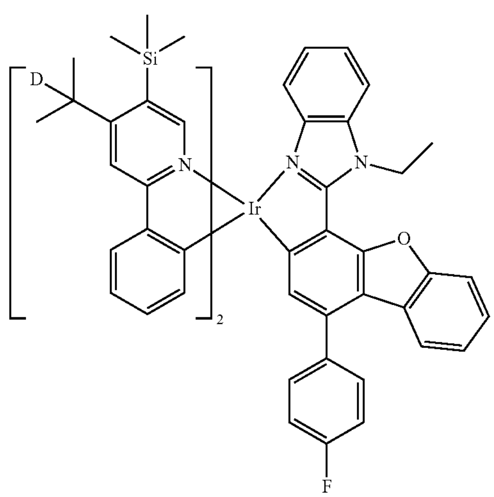

-continued
2167
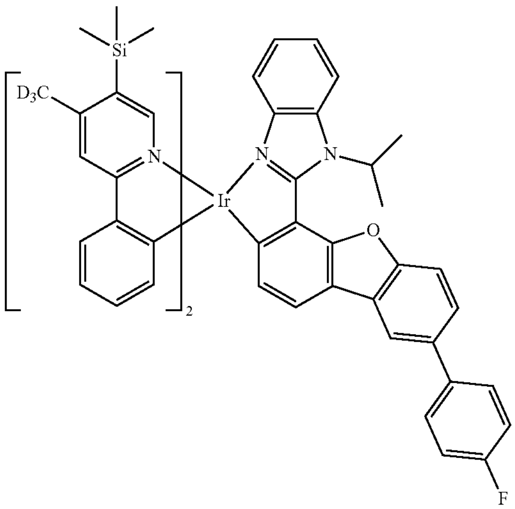
2168
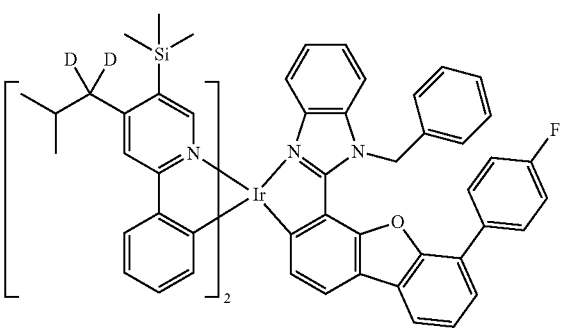
2169
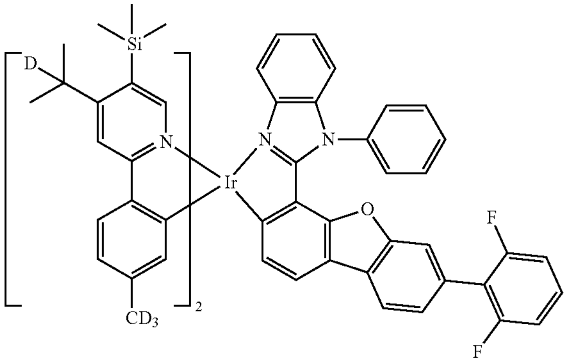
-continued
2170
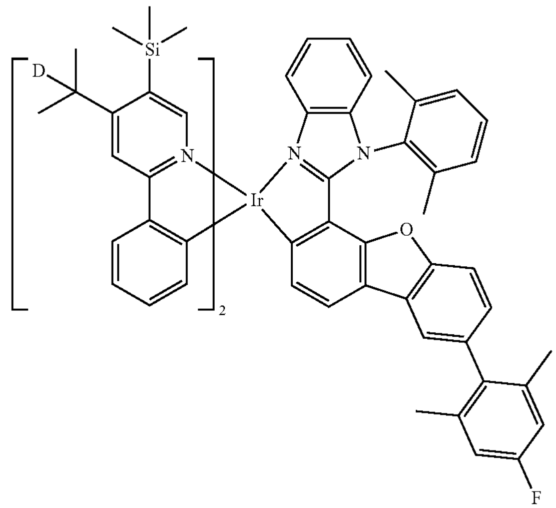
2171
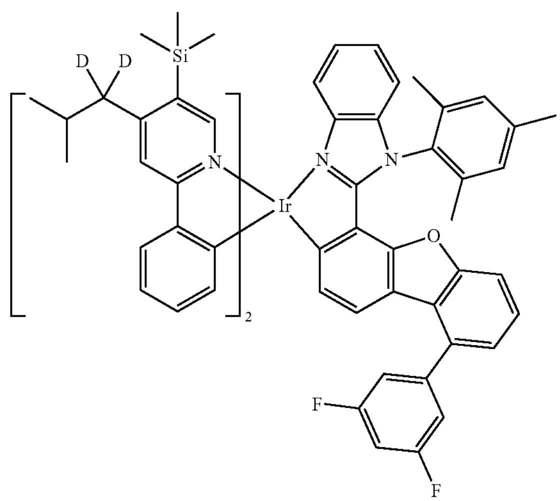
2172
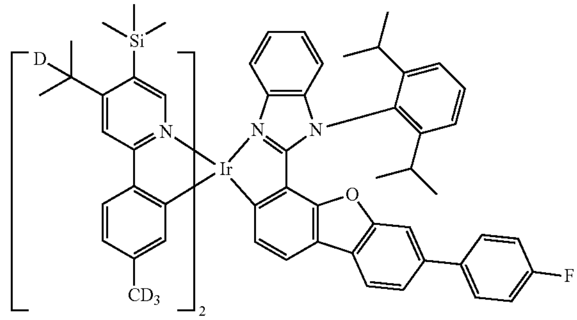

-continued
2173
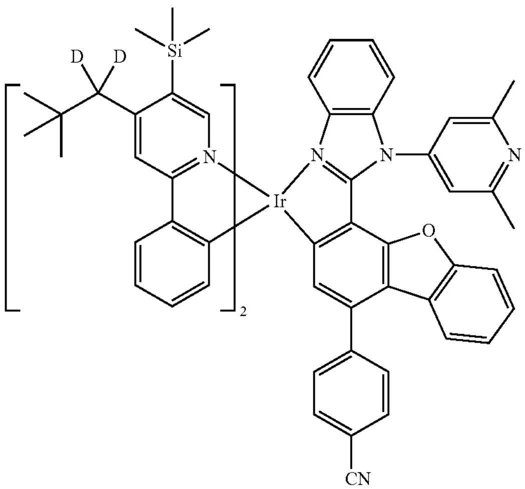
2174
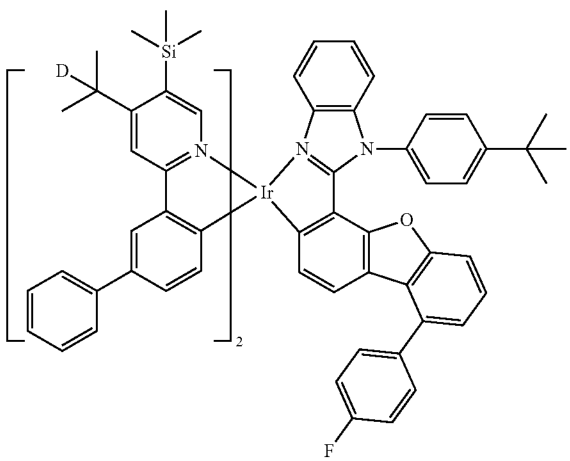
2175
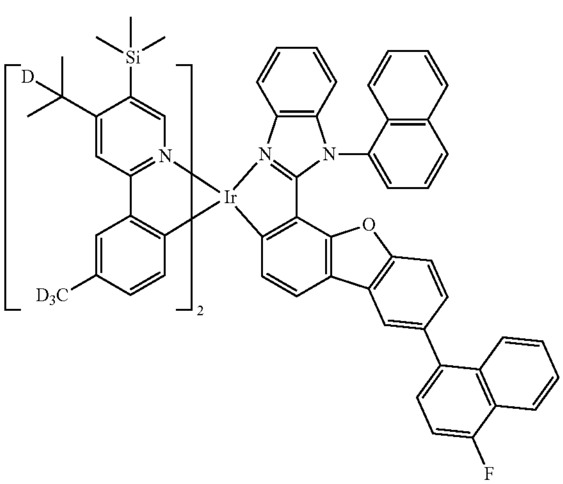
-continued
2176
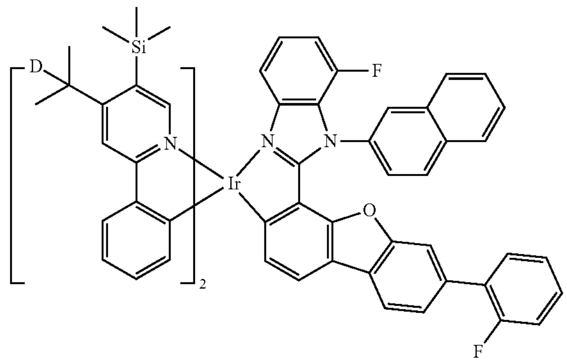
2177
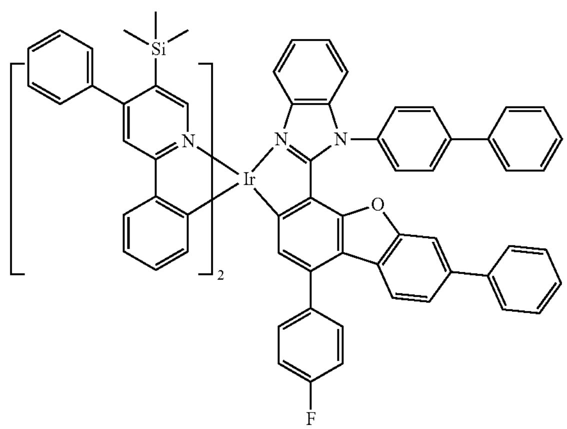
2178
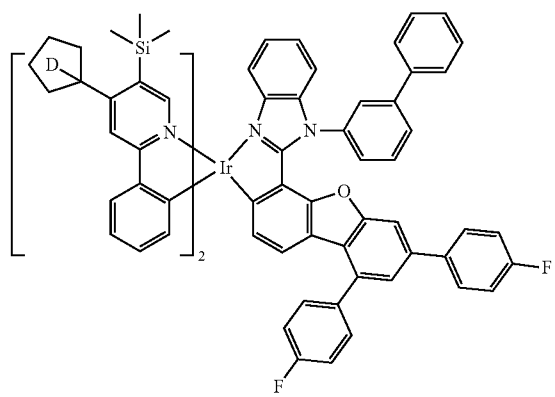
2179
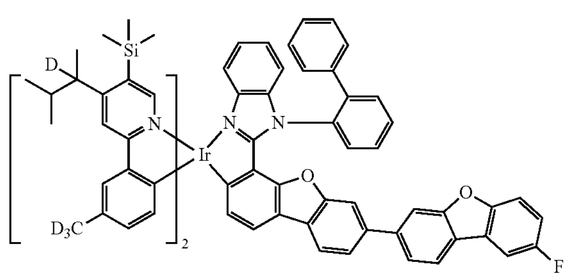

-continued
2180
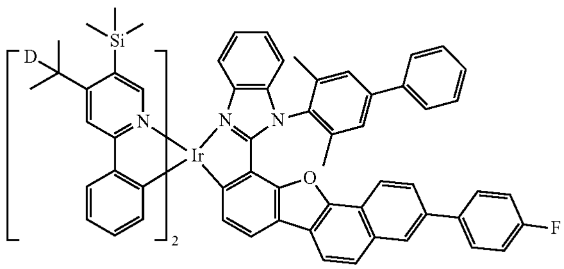
2181
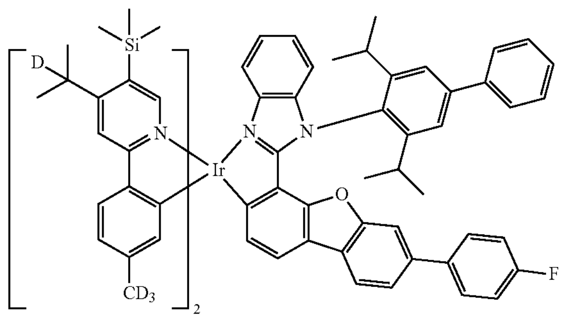
2182
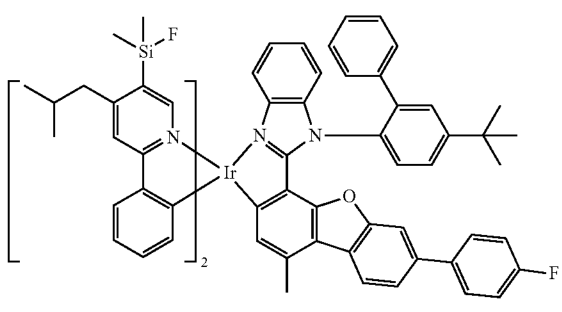
2183
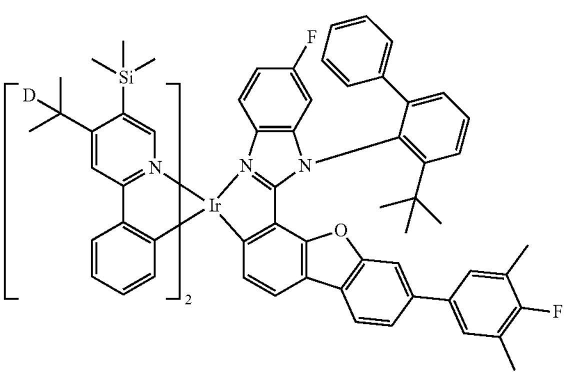
-continued
2184
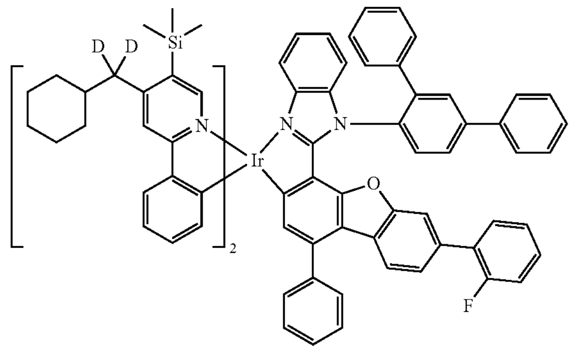
2185
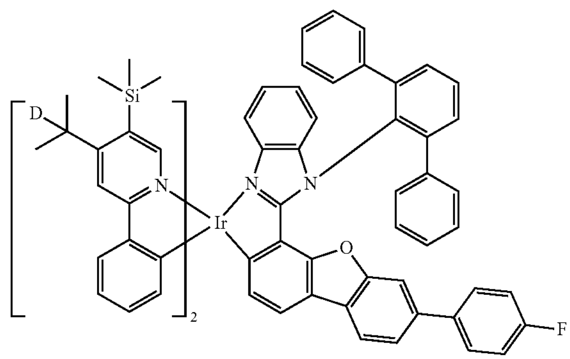
2186
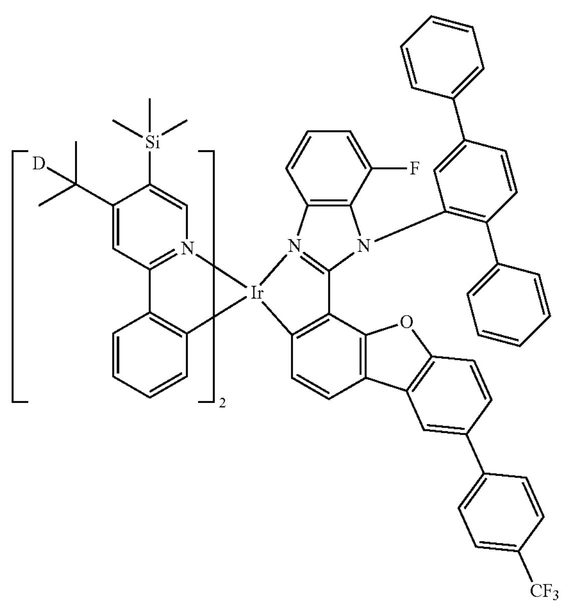

-continued
2187
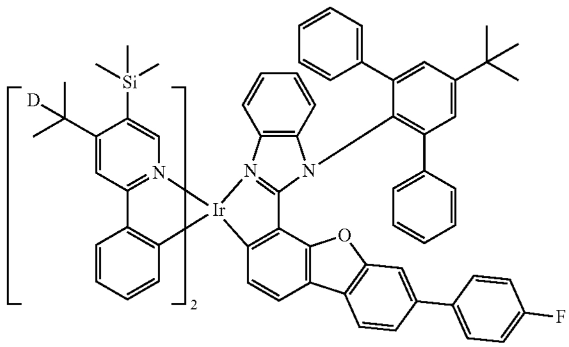
2188
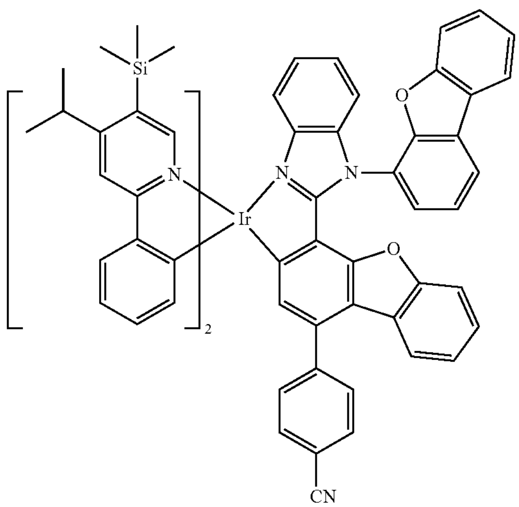
2189
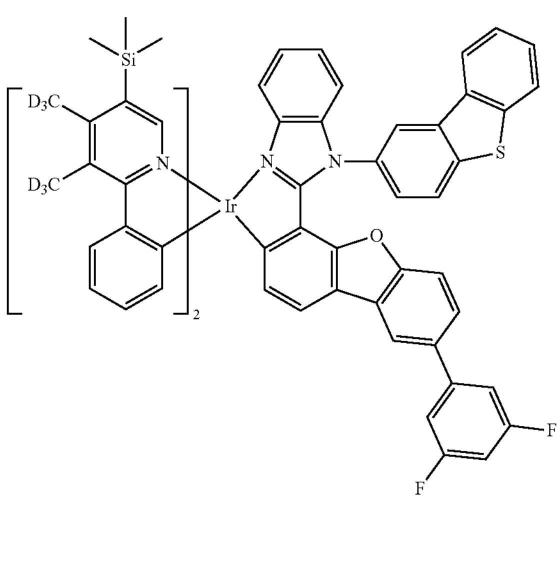
-continued
2190
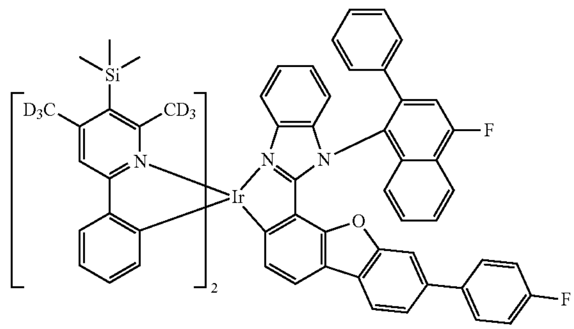
2191
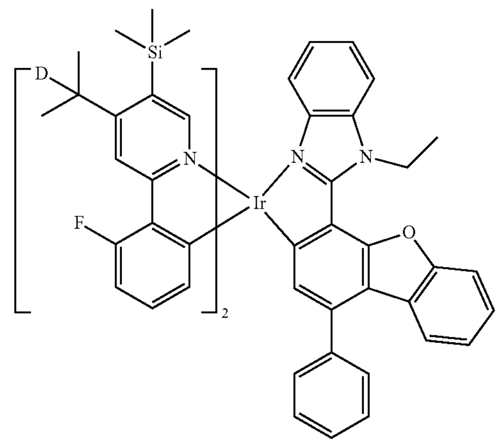
2192
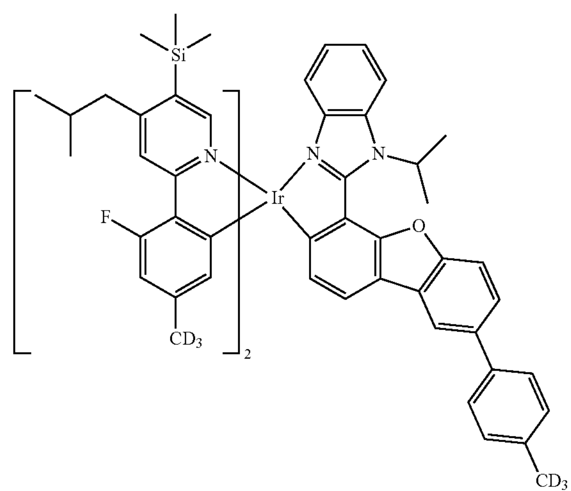
2193
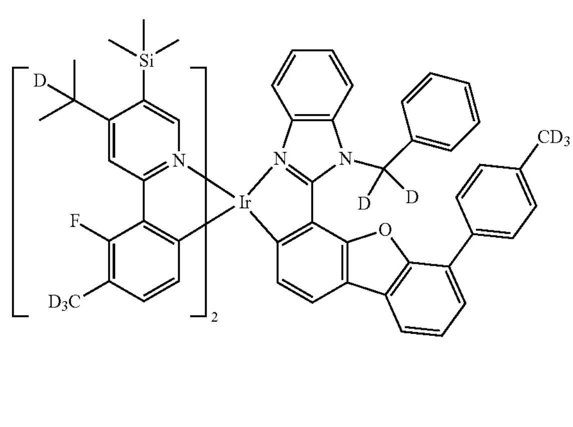

-continued
2194
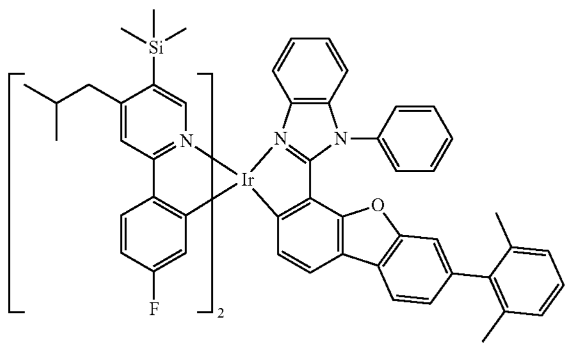
2195
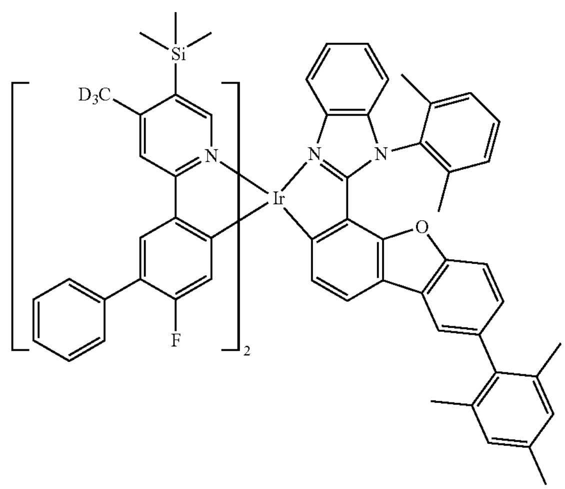
2196
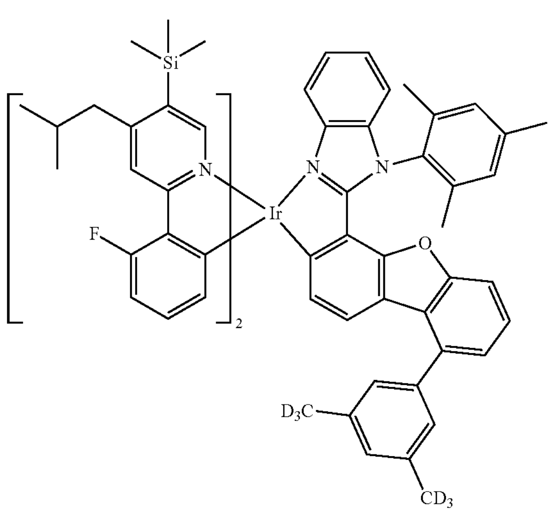
-continued
2197
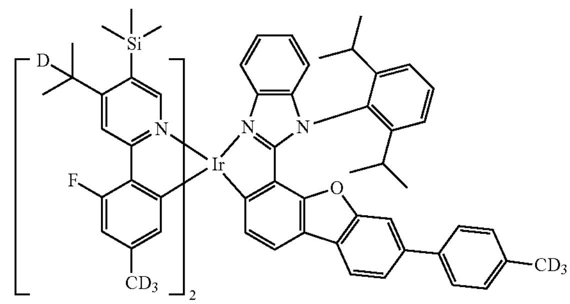
2198
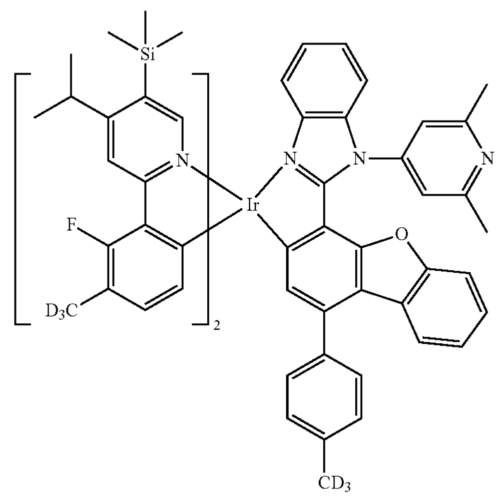
2199
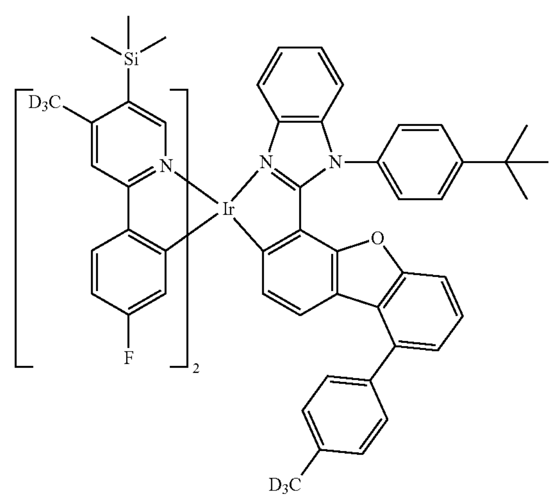

-continued
2200
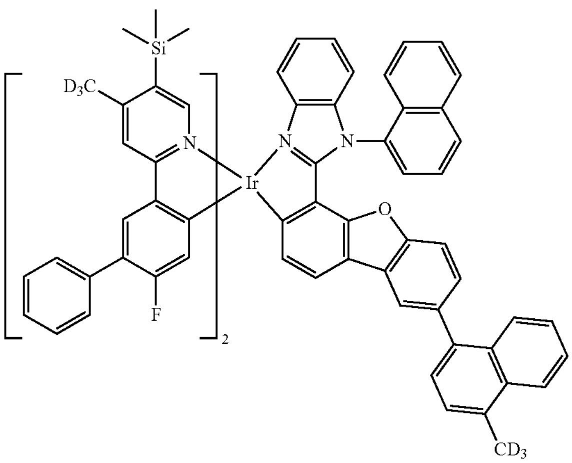
2201
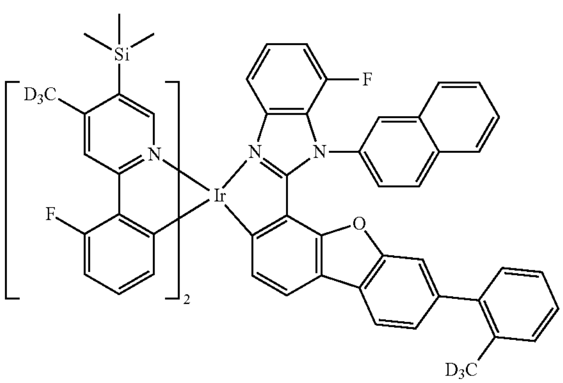
2202
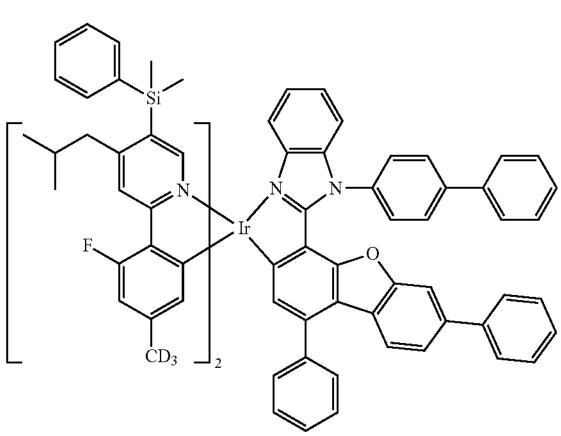
-continued
2203
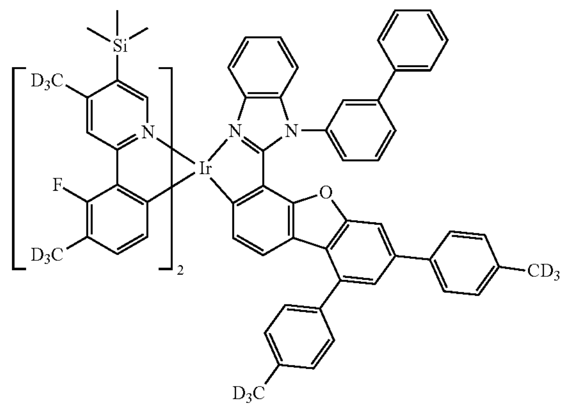
2204
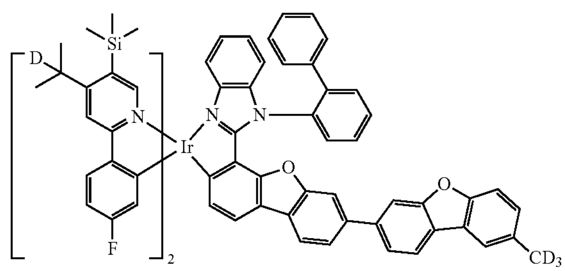
2205
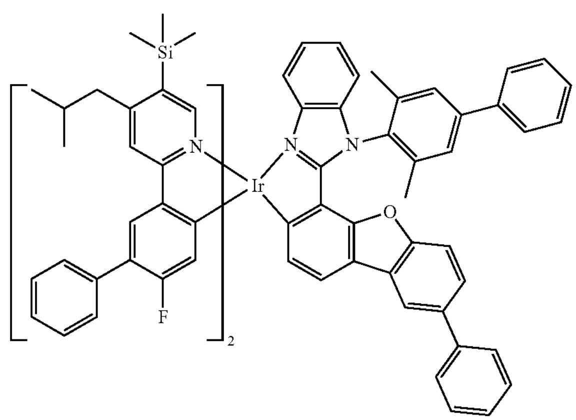
2206
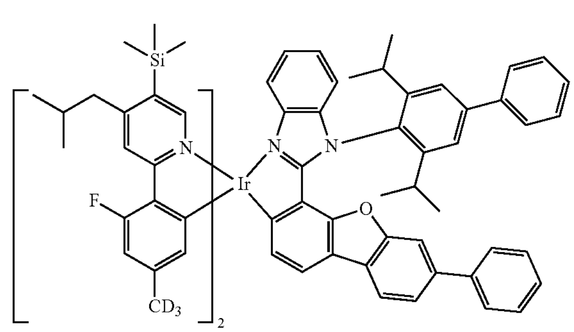

-continued
2207
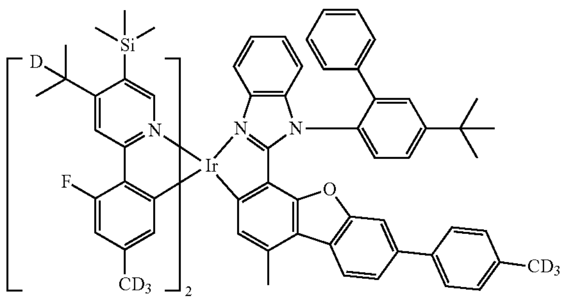
2208
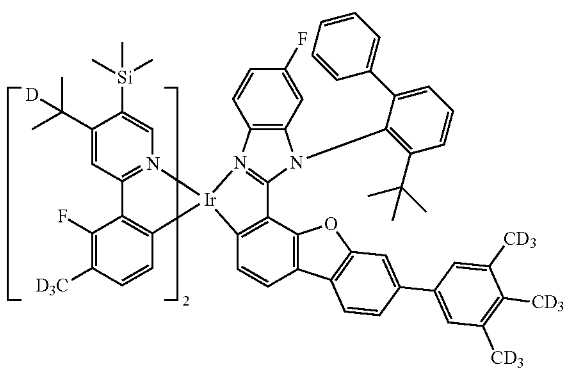
2209
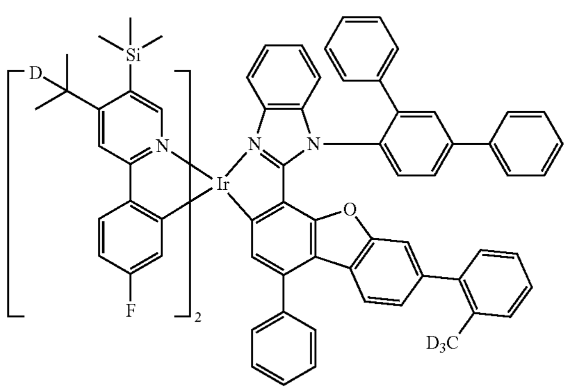
2210
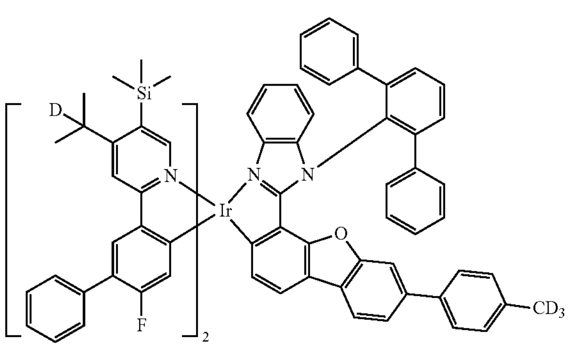
-continued
2211
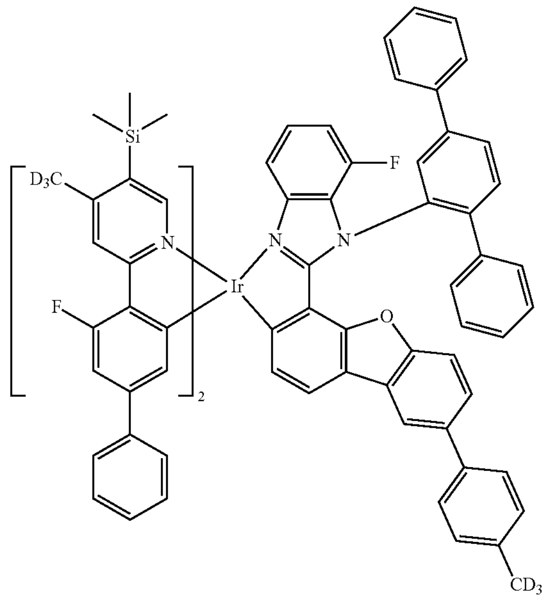
2212
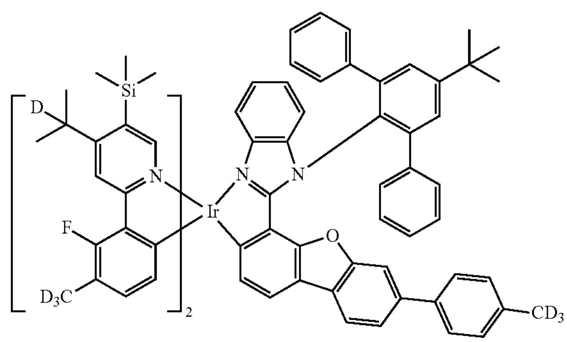
2213
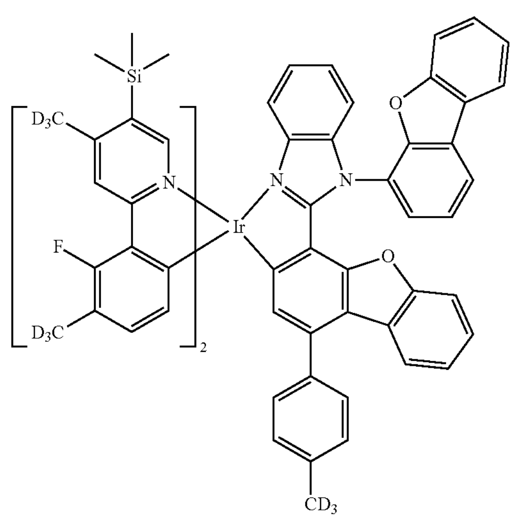

-continued
2214
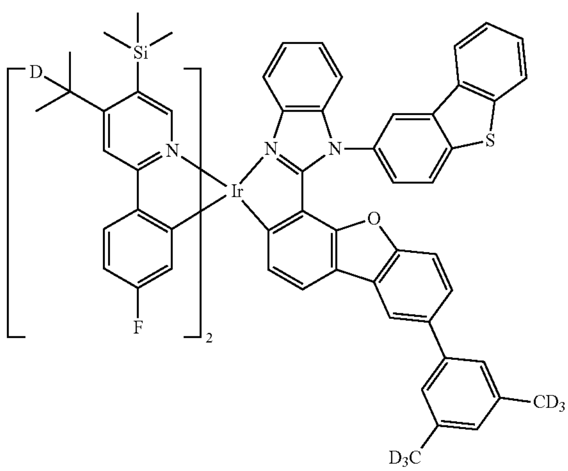
2215
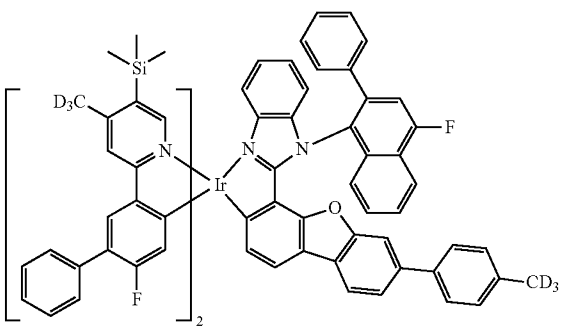
2216
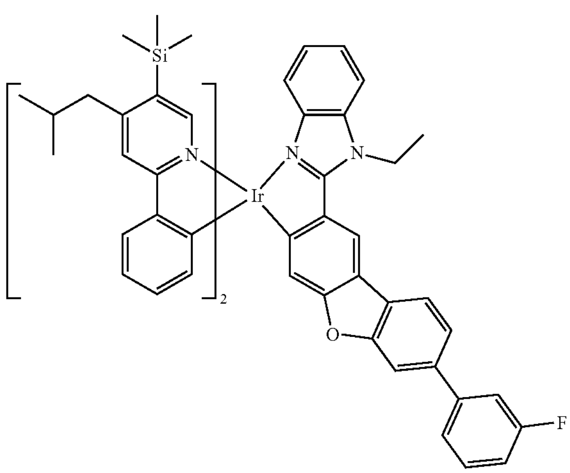
-continued
2217
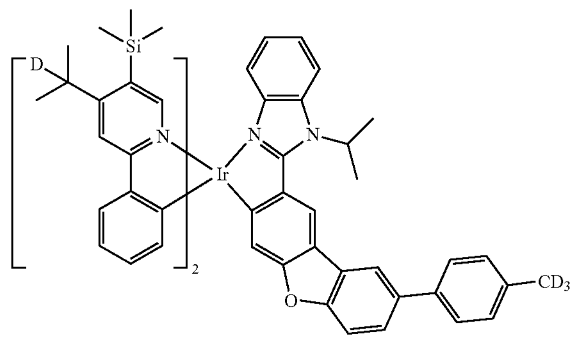
2218
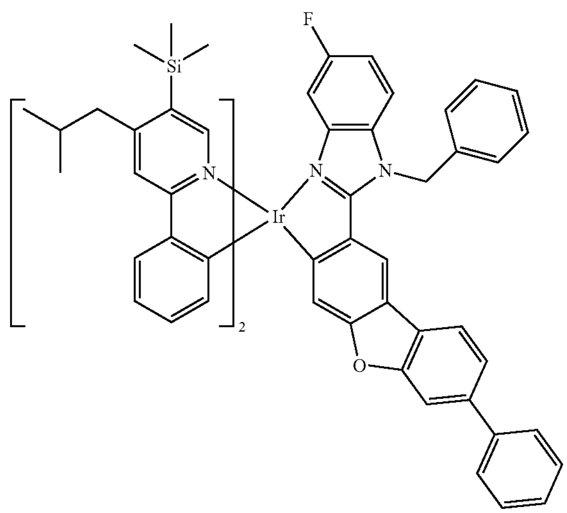
2219
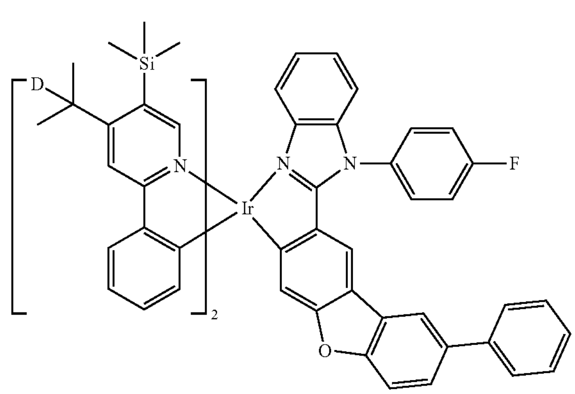

2220
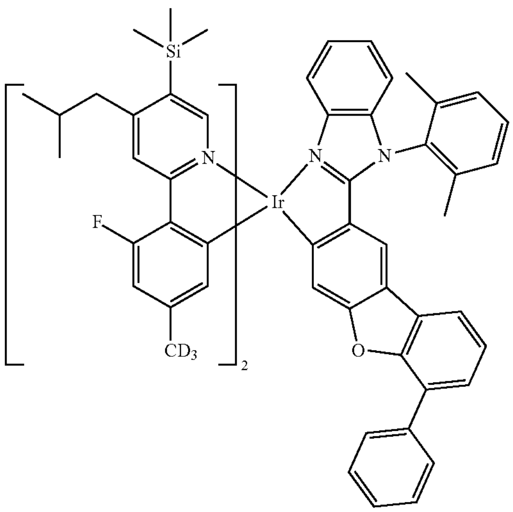
2221
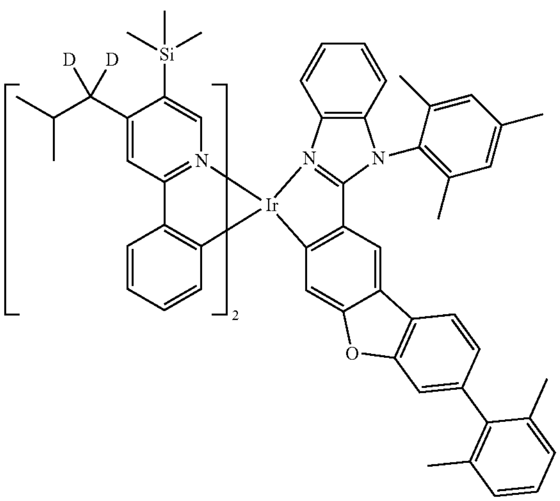
2222
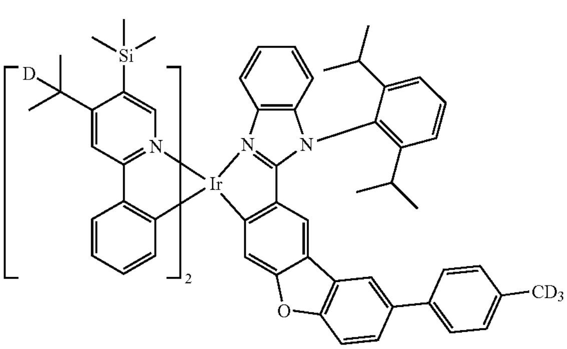
2223
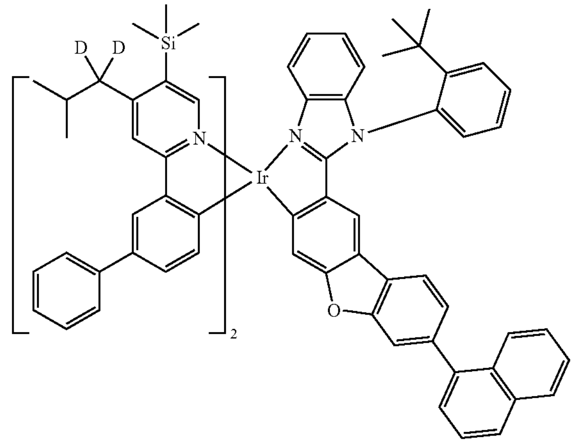
2224
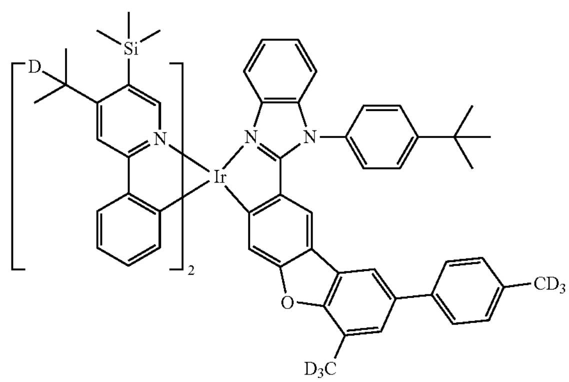
2225
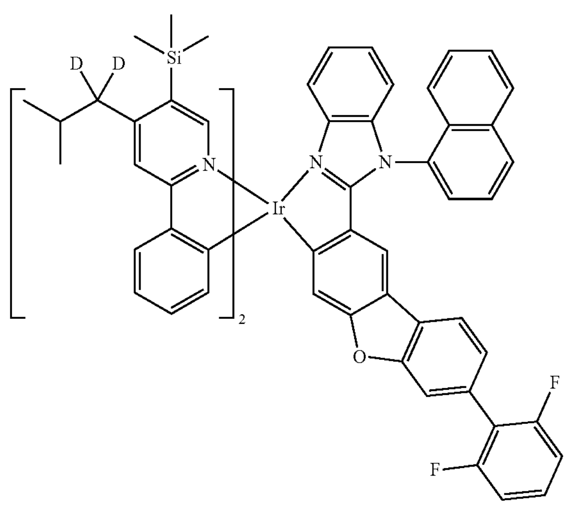

-continued
2226
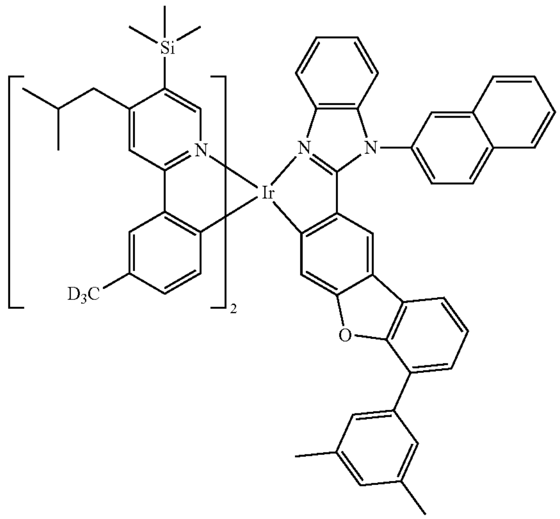
2227
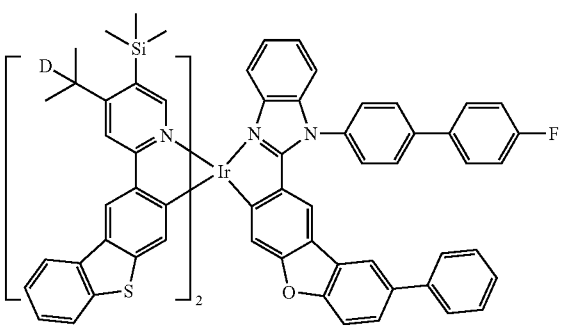
2228
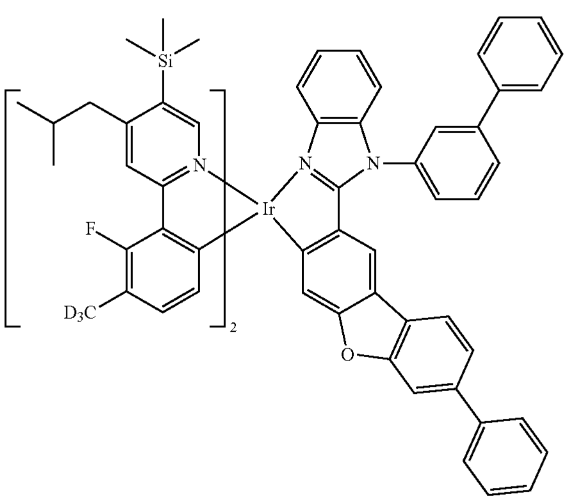
-continued
2229
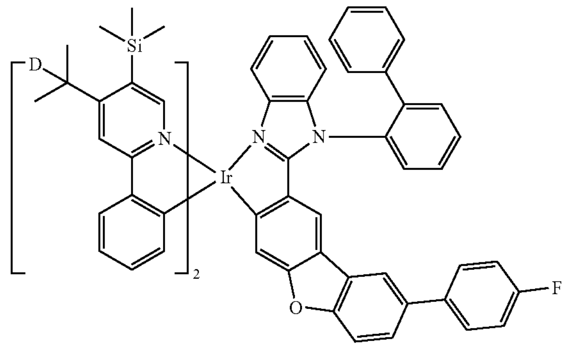
2230
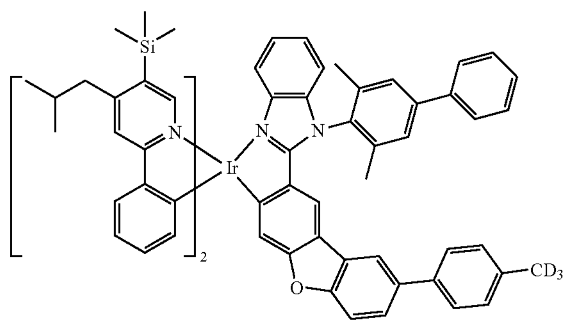
2231
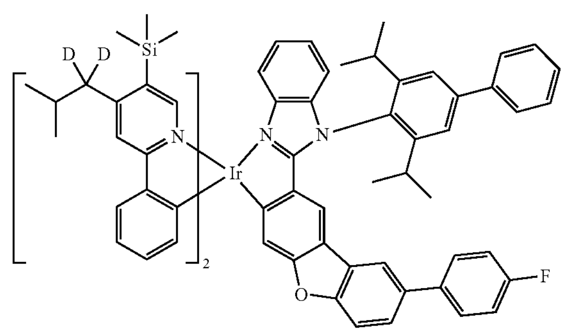
2232
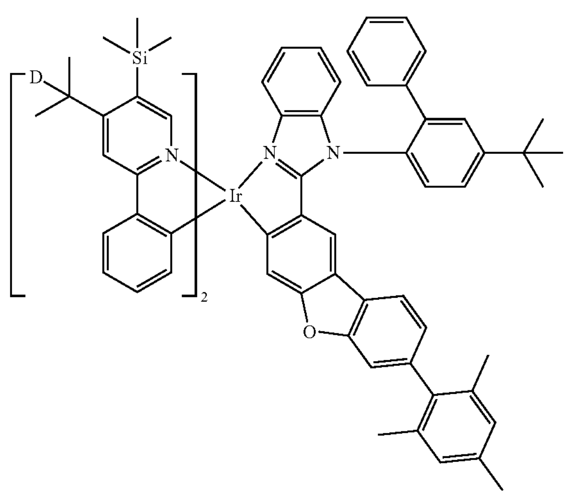

-continued
2233
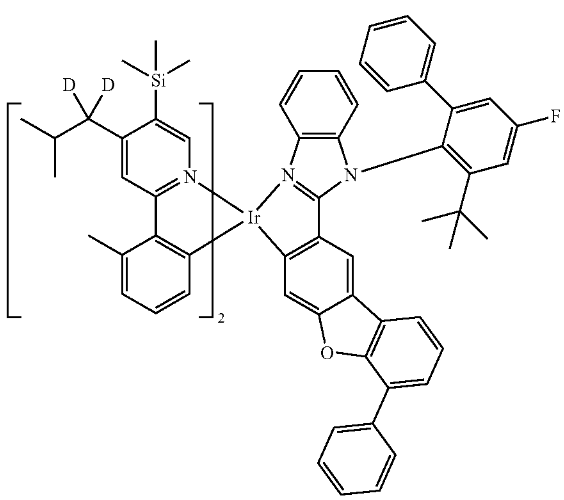
2234
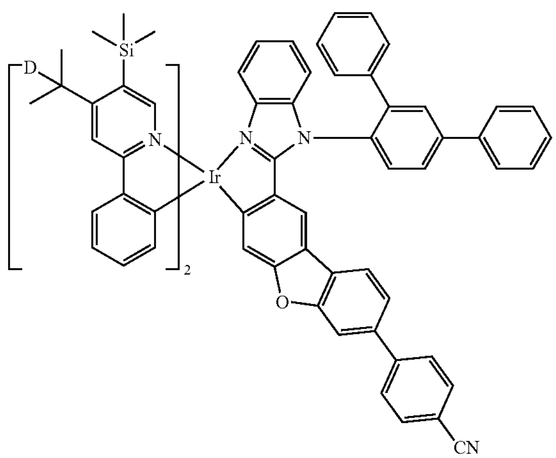
2235
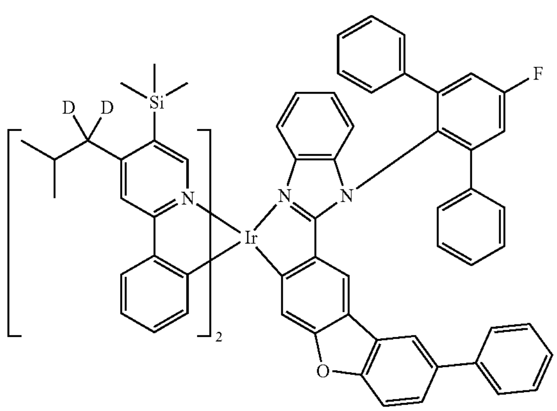
-continued
2236
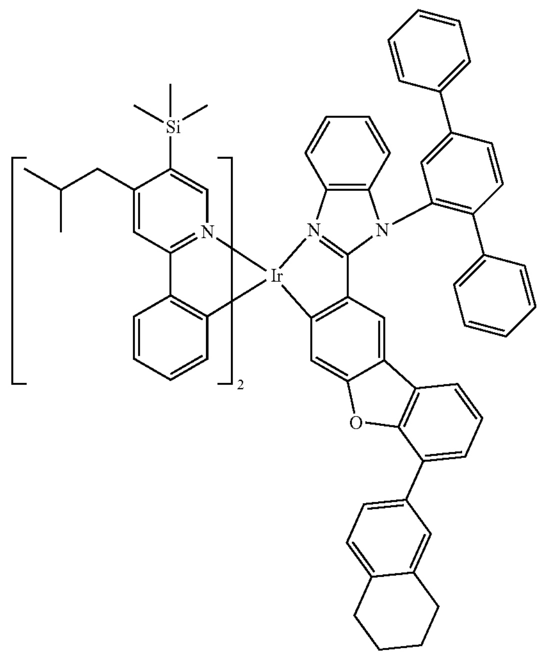
2237
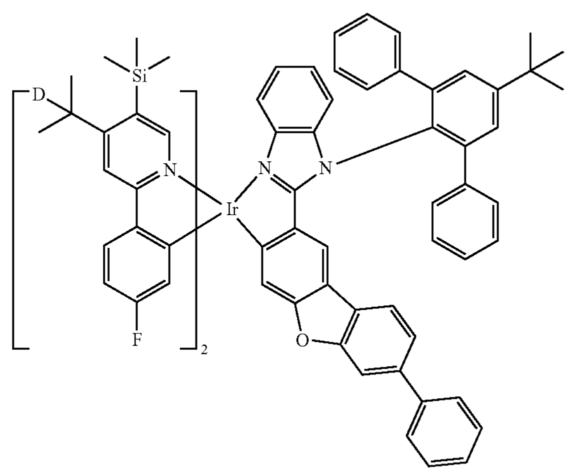
2238
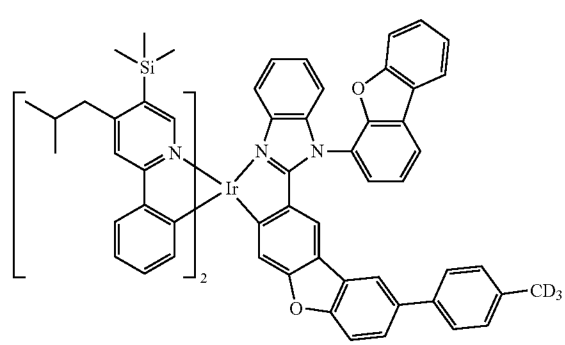

-continued
2239
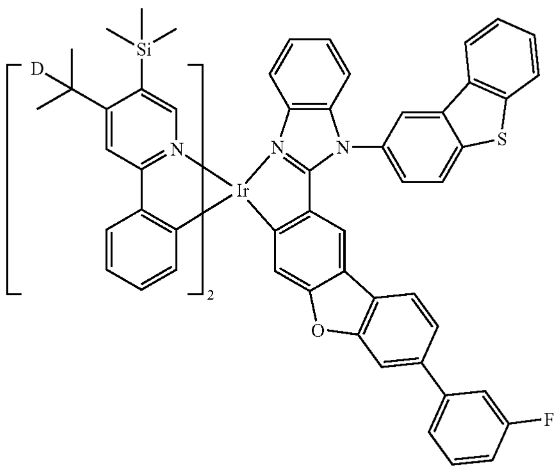
2240
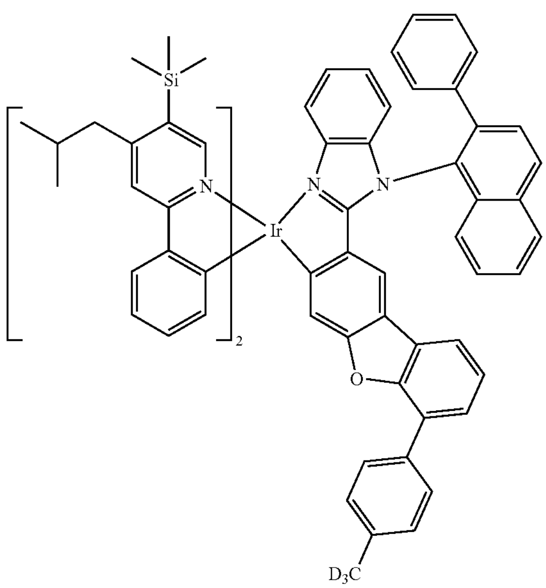
2241
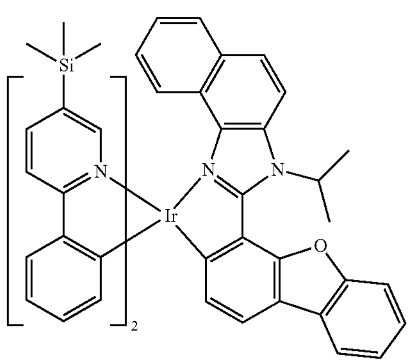
-continued
2242
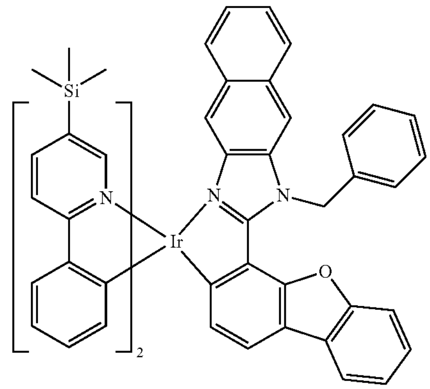
2243
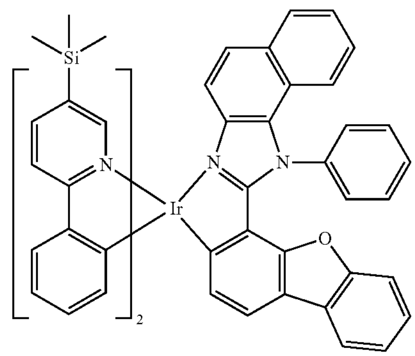
2244
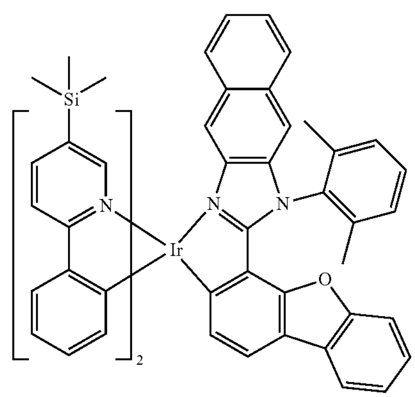
2245
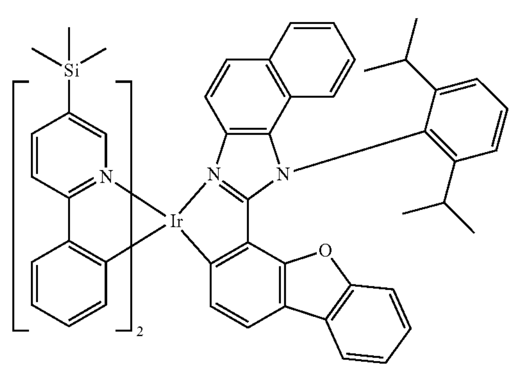

-continued
2246
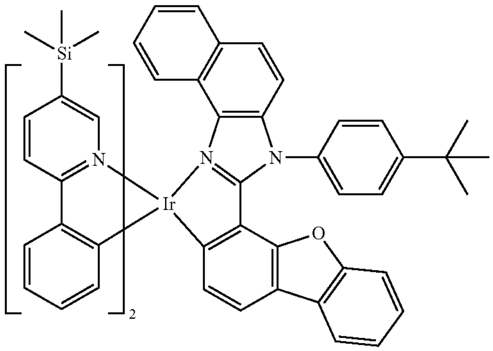
2247
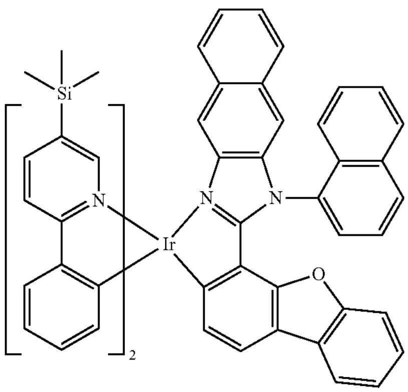
2248
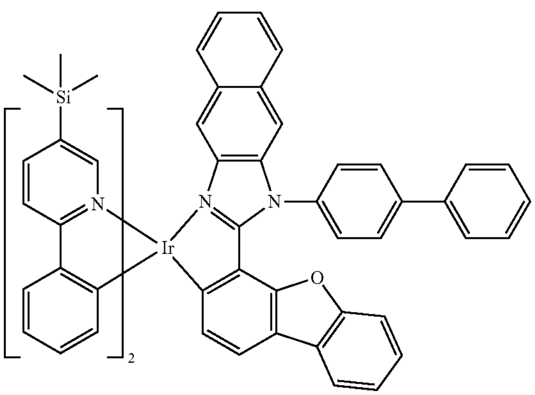
2249
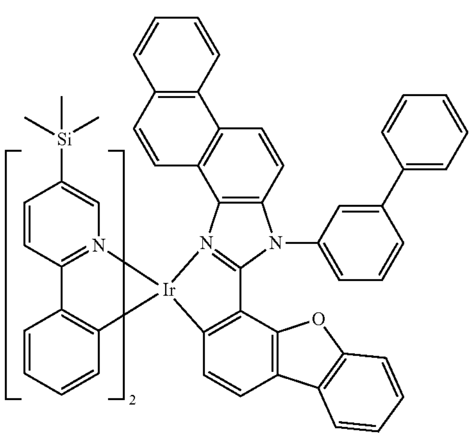
-continued
2250
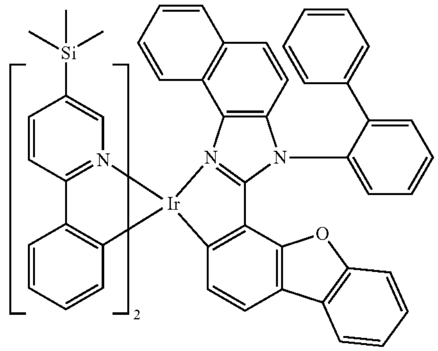
2251
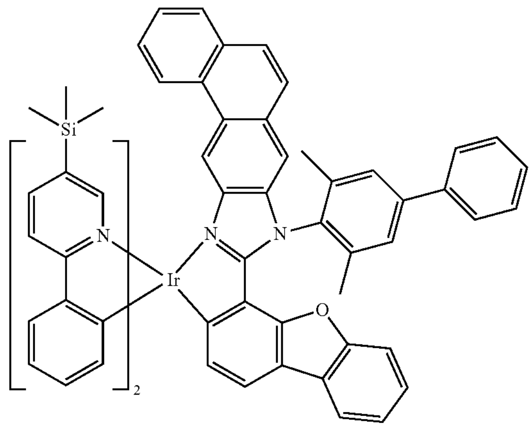
2252
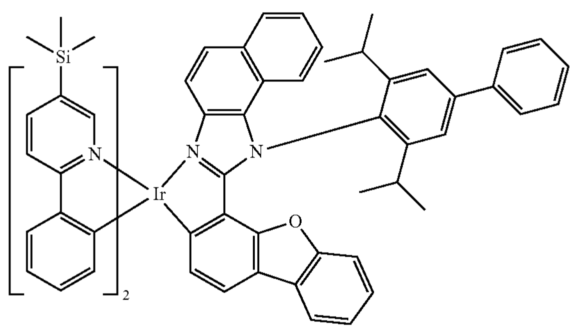
2253
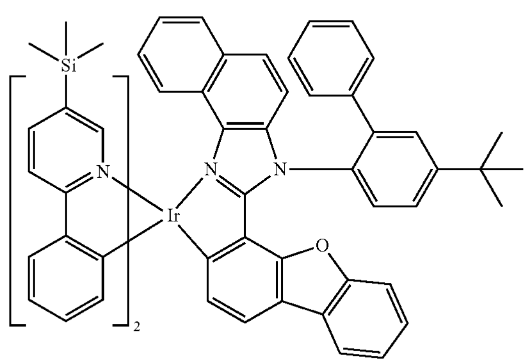

-continued
2254
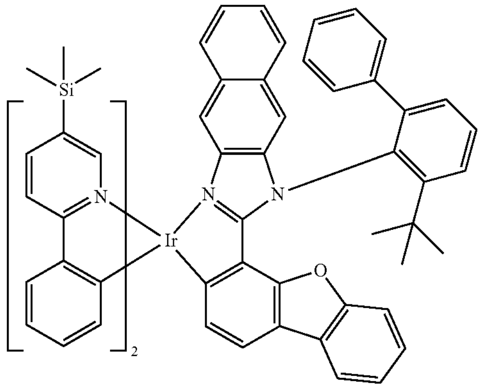
2255
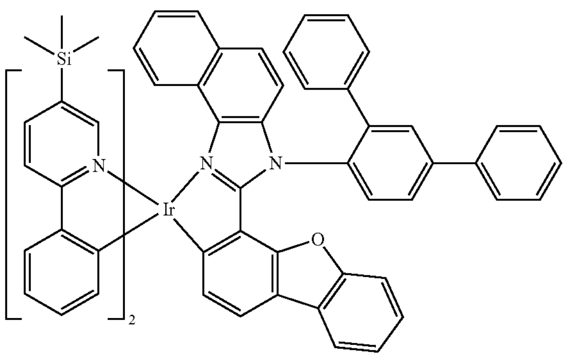
2256
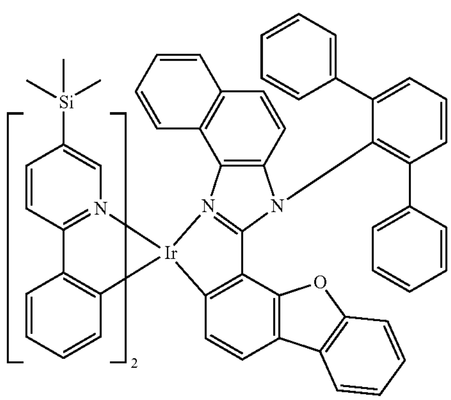
2257
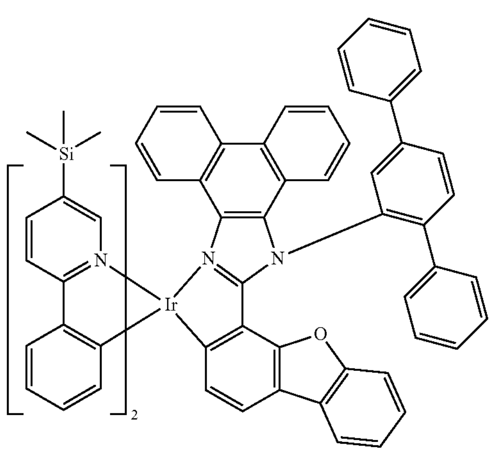
-continued
2258
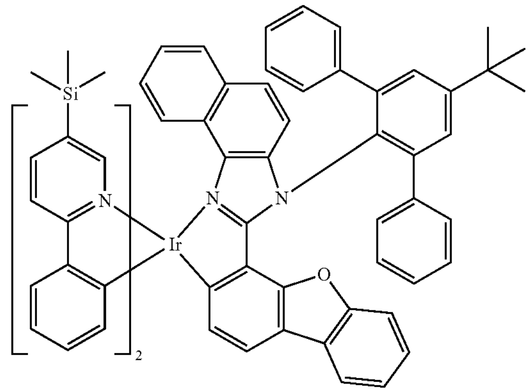
2259
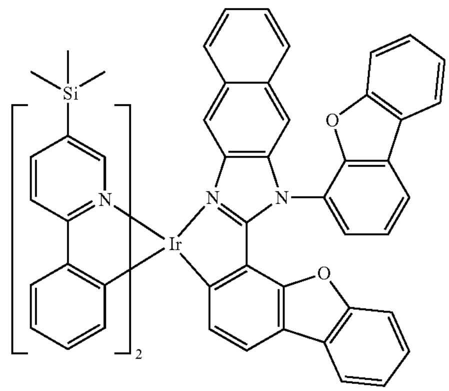
2260
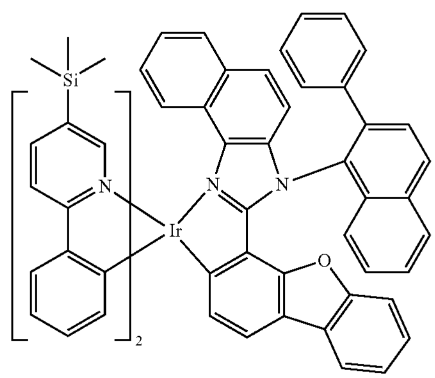
2261
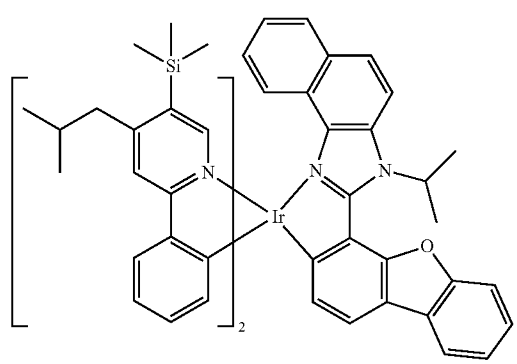

-continued
2262
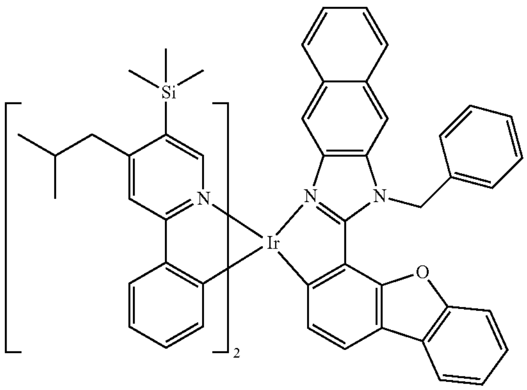
2263
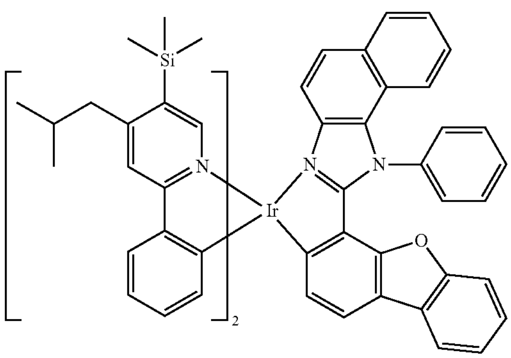
2264
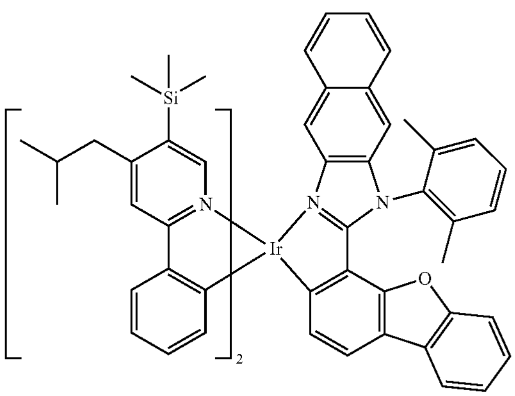
2265
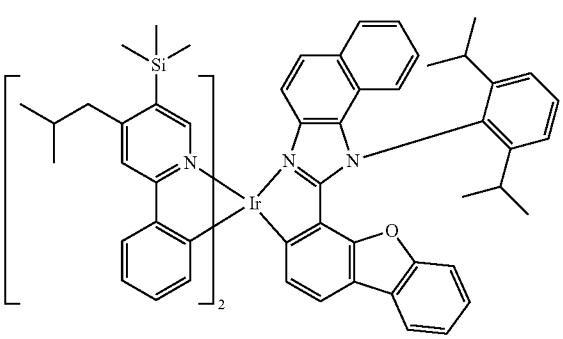
-continued
2266
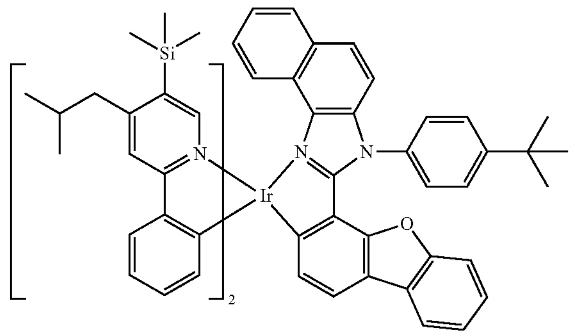
2267
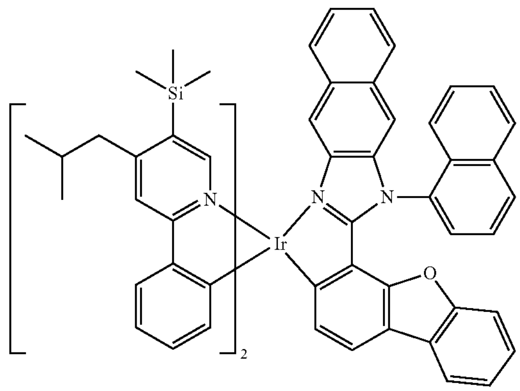
2268
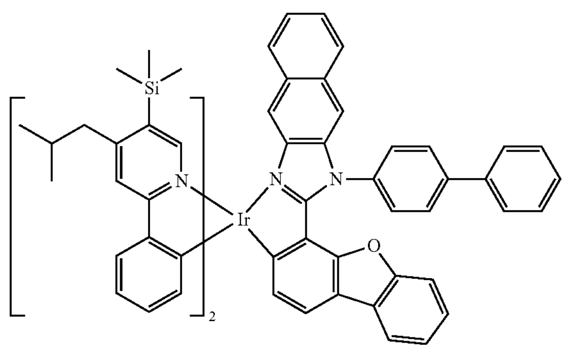
2269
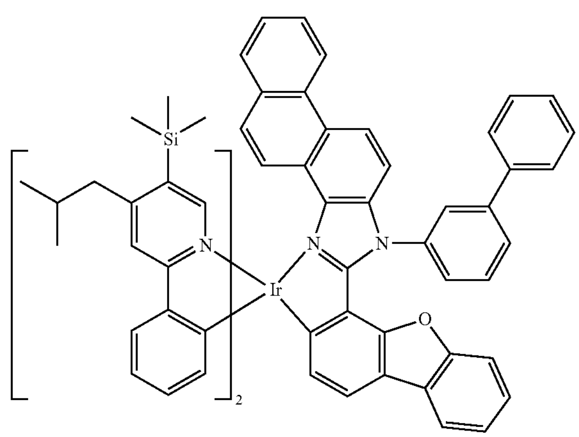

2270
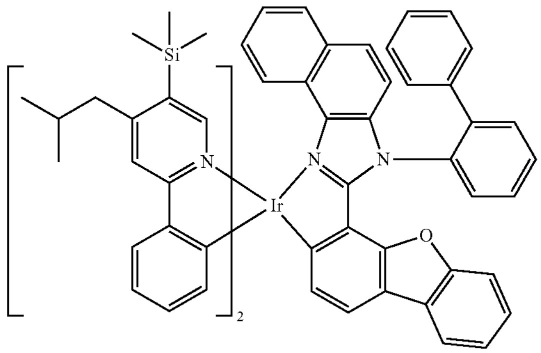
2271
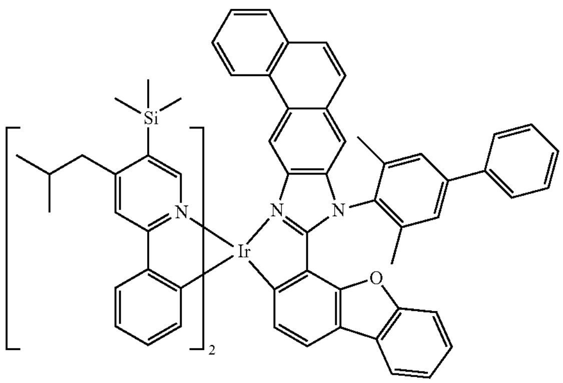
2272
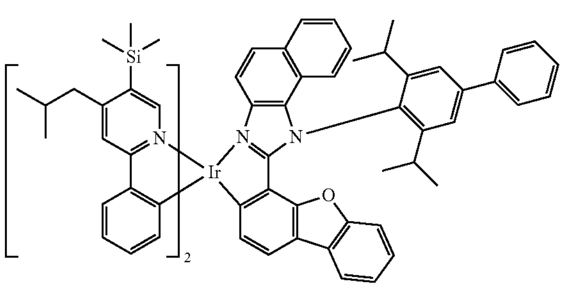
2273
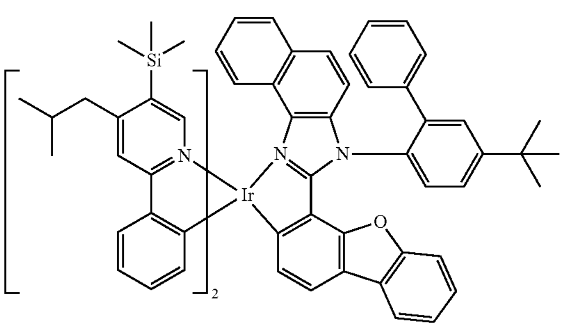
2274
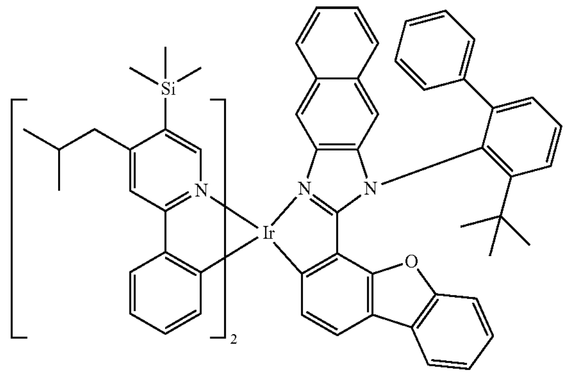
2275
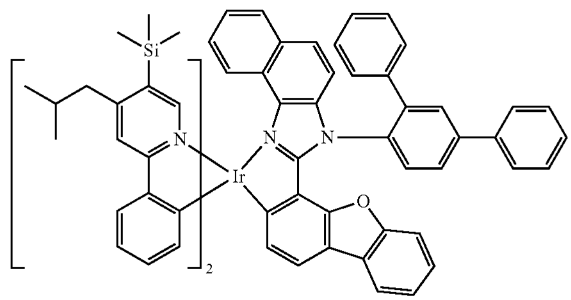
2276
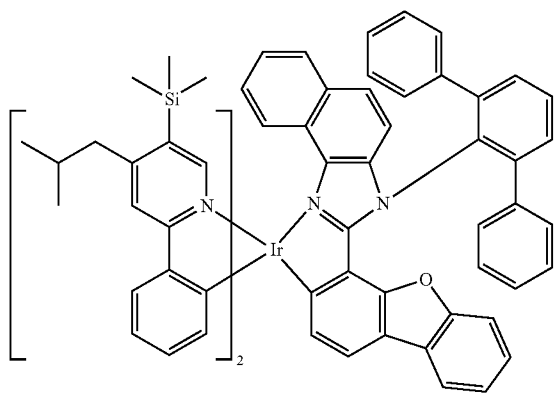
2277
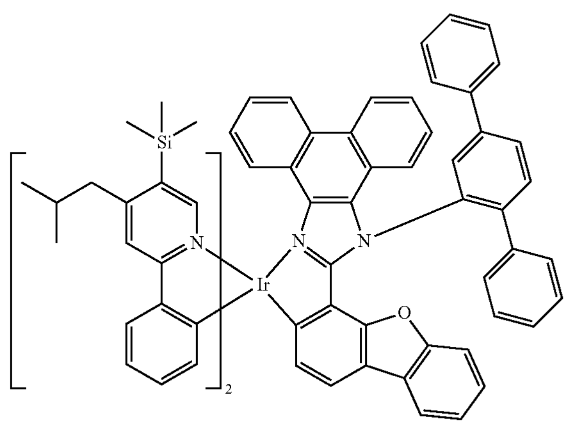

2278
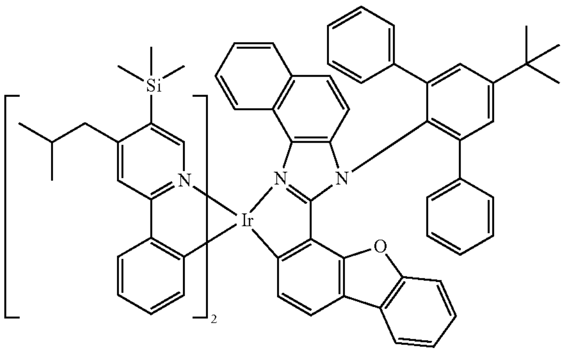
2279
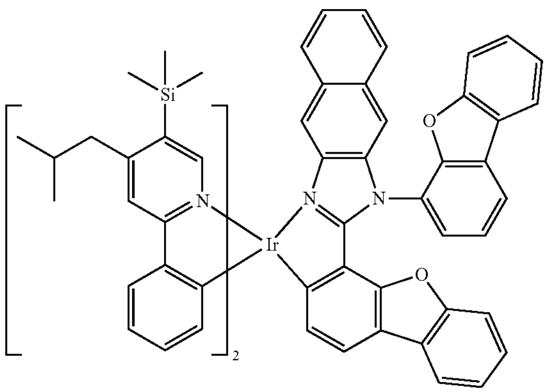
2280
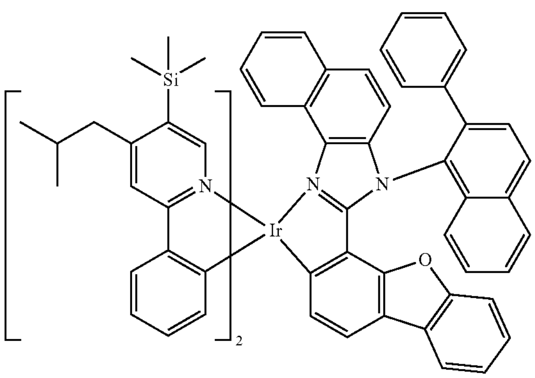
2281
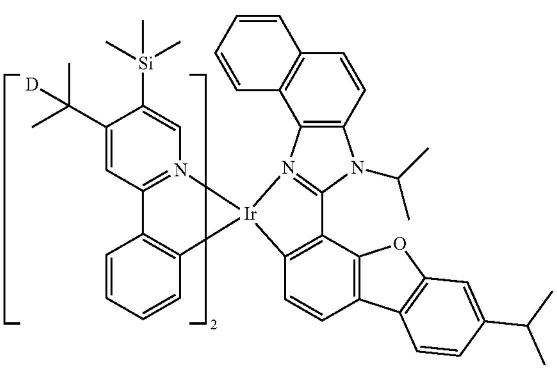
2282
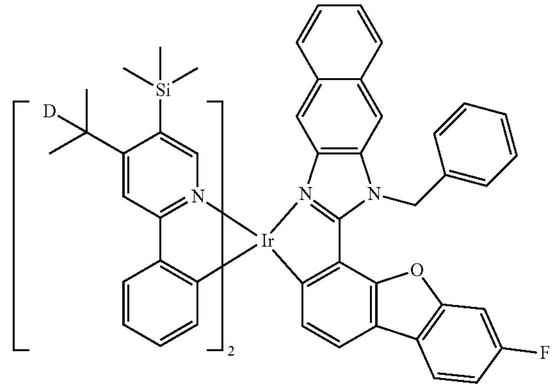
2283
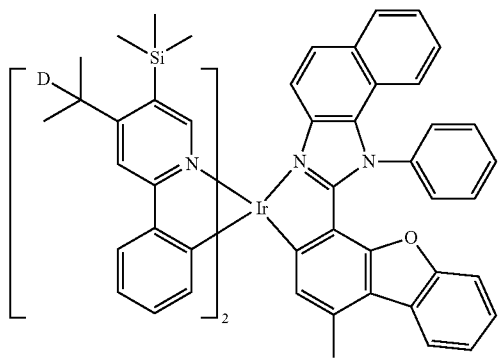
2284
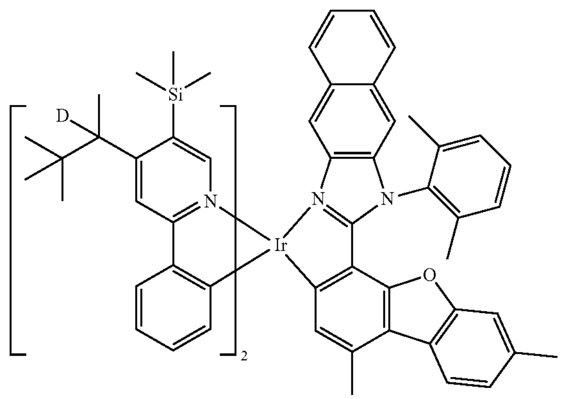
2285
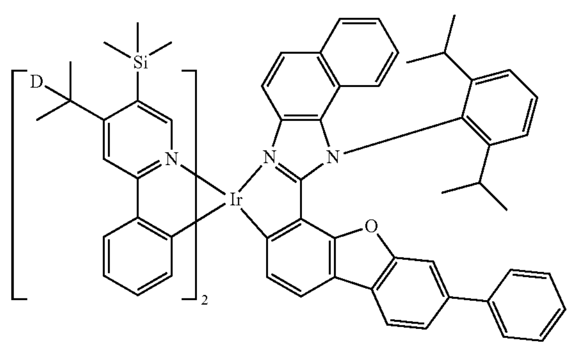

-continued
2286
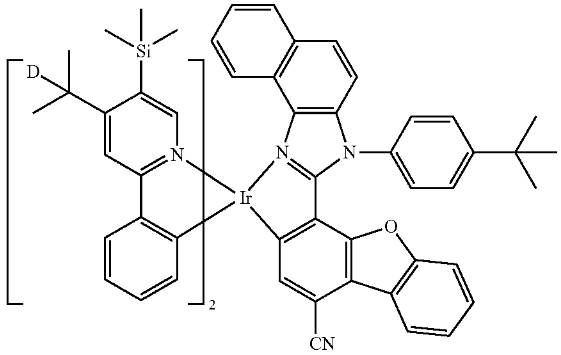
2287
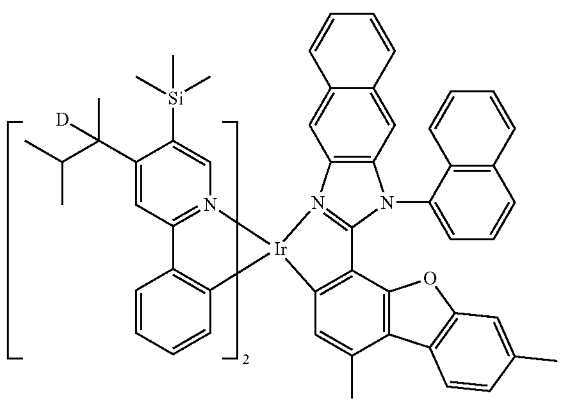
2288
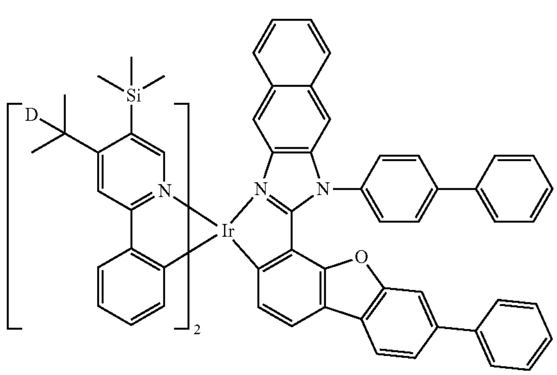
-continued
2289
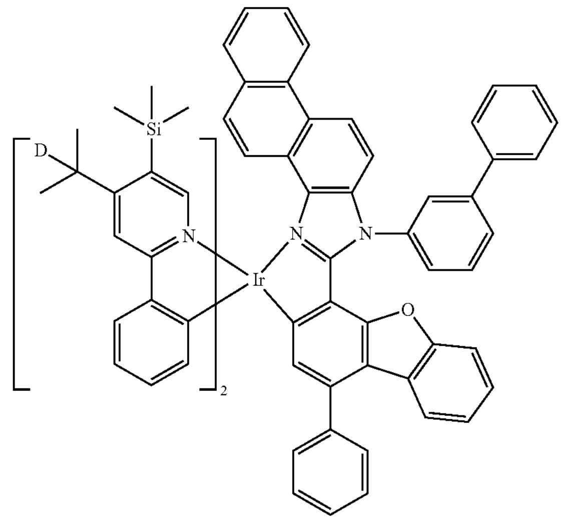
2290
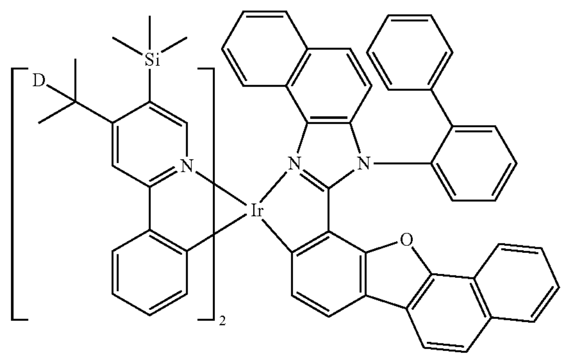
2291
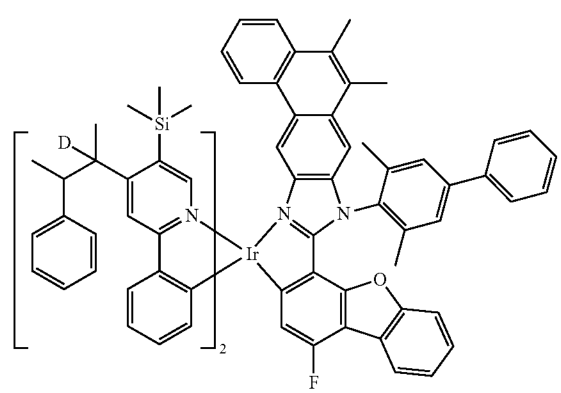
2292
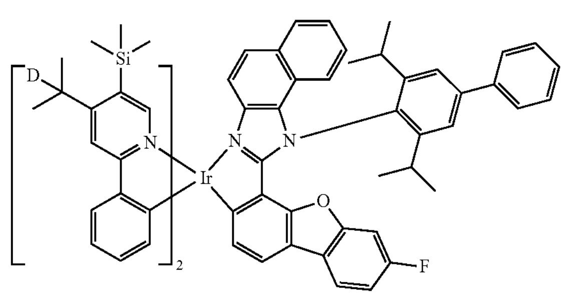

-continued
2293
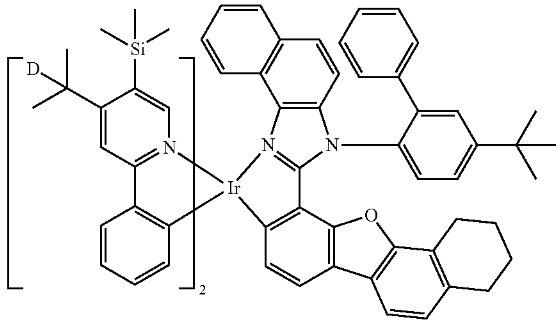
2294
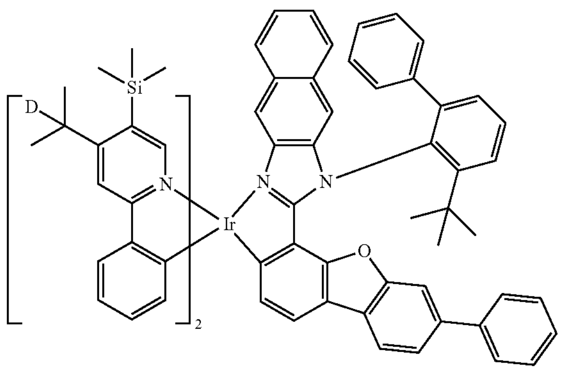
2295
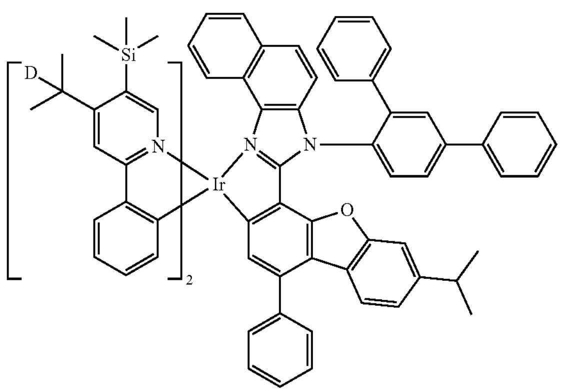
2296
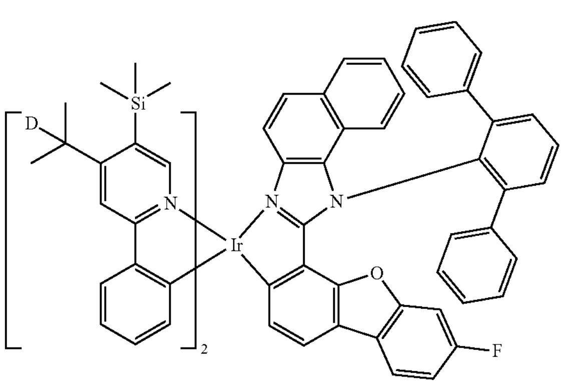
-continued
2297
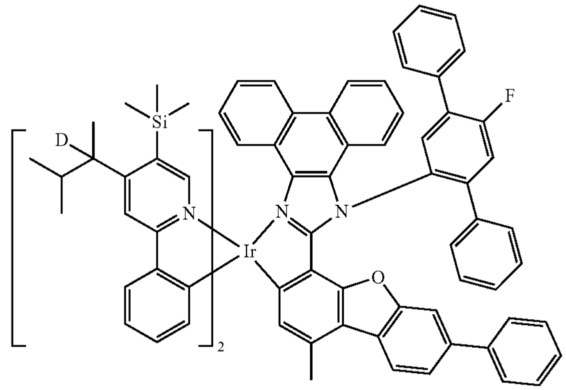
2298
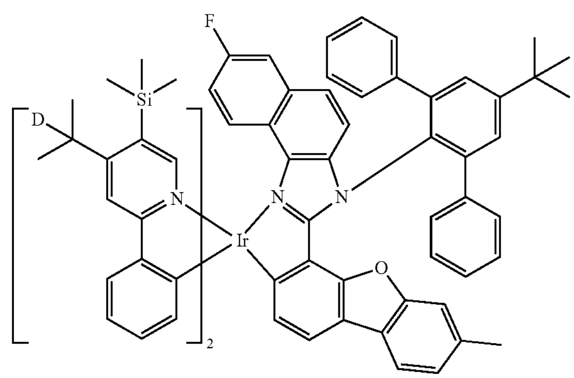
2299
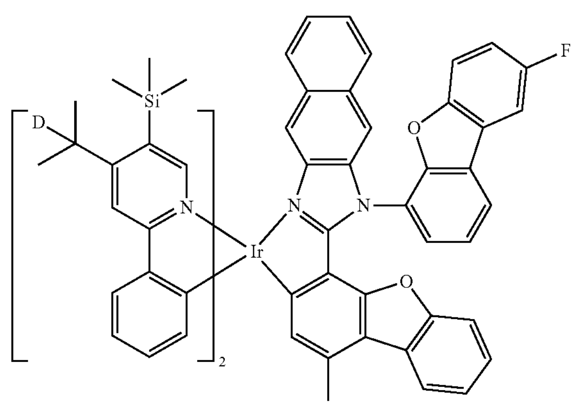
2300
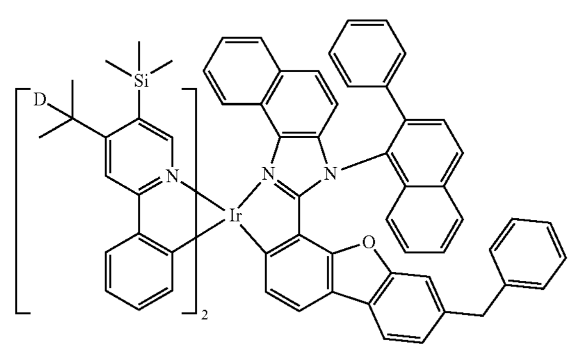

-continued
2301
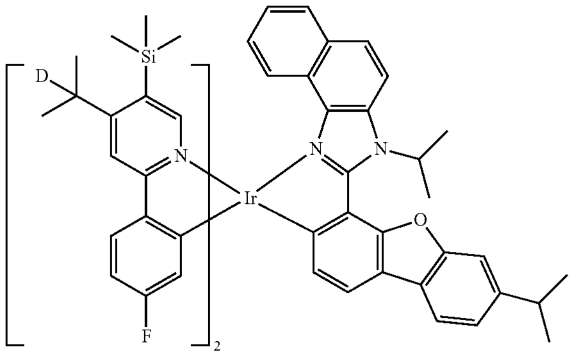
2302
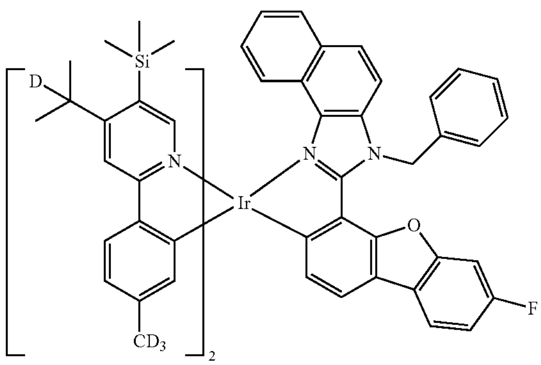
2303
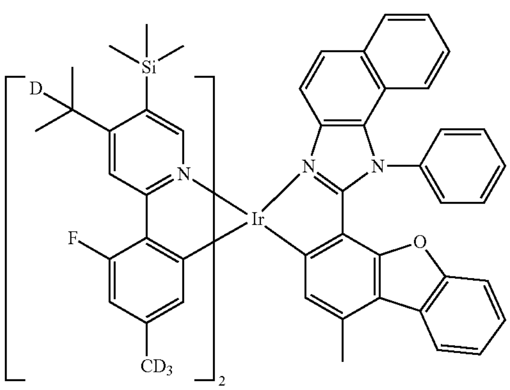
2304
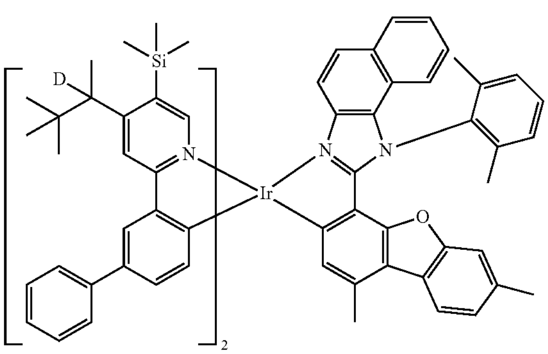
2305
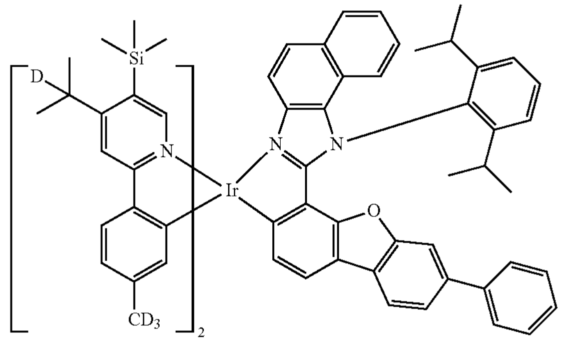
2306
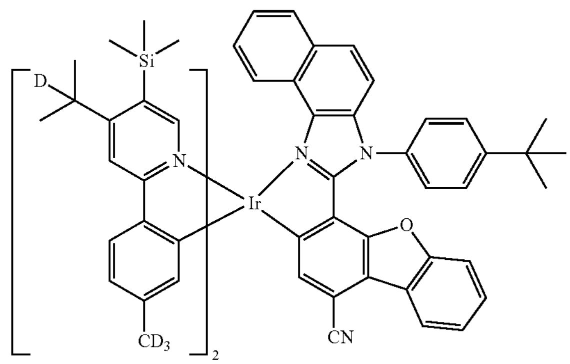
2307
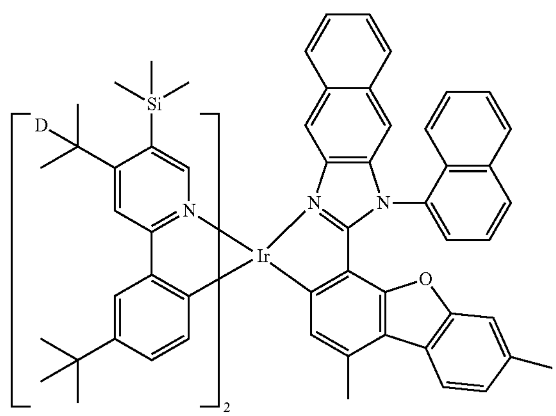
2308
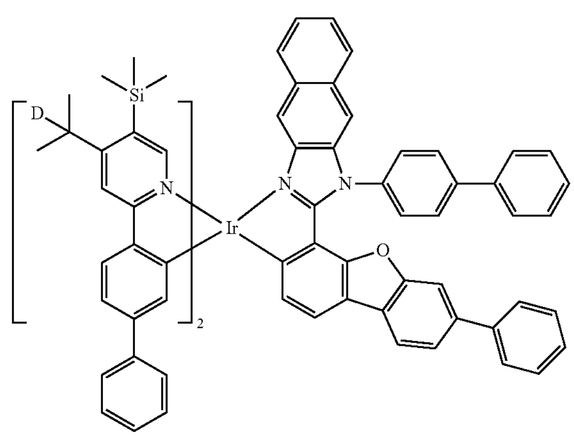

2309
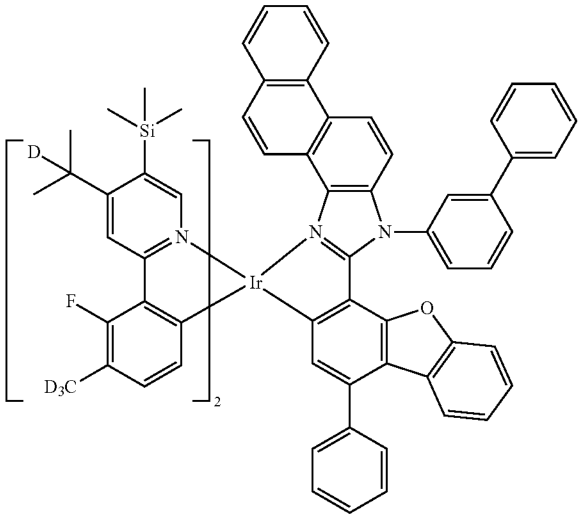
2310
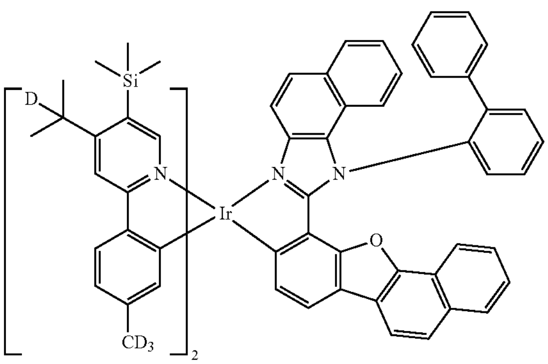
2311
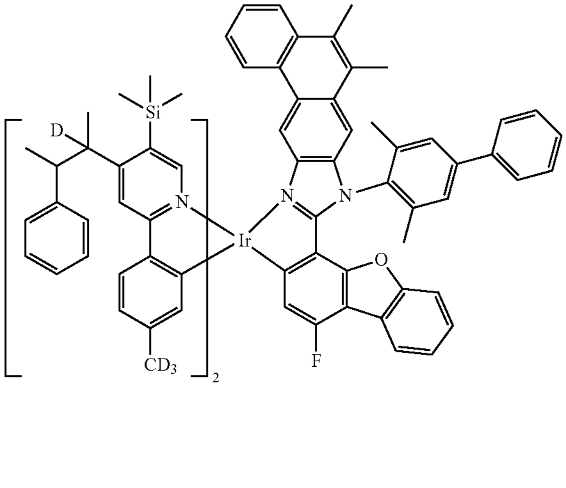
2312
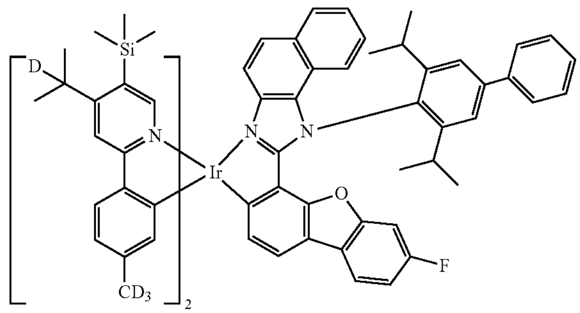
2313
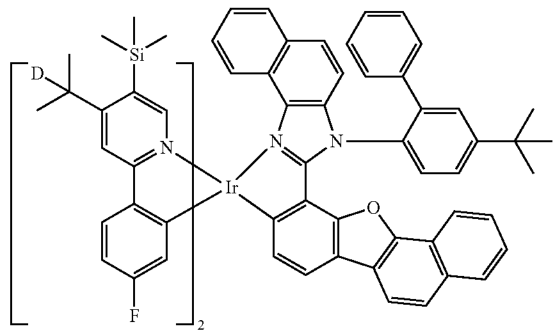
2314
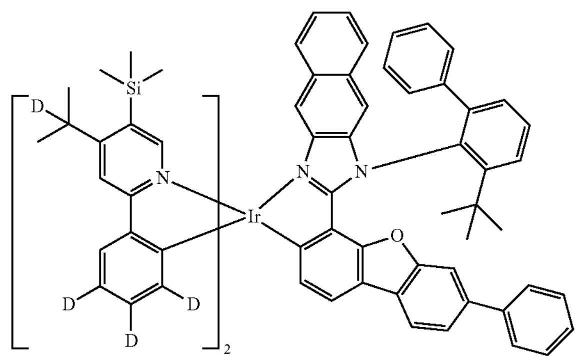
2315
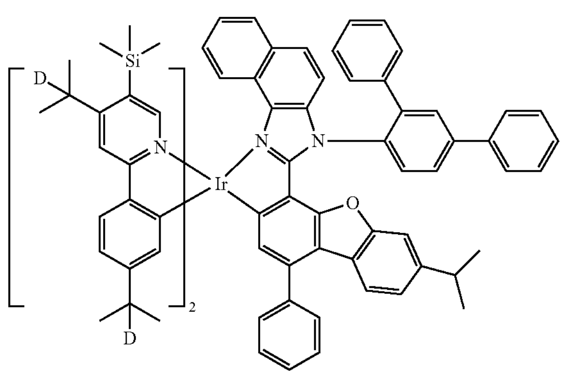

-continued
2316
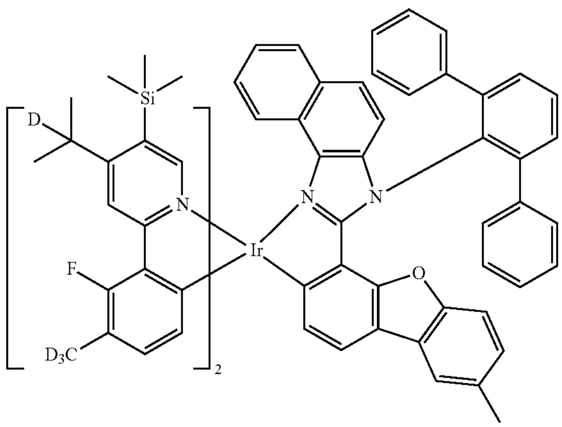
2317
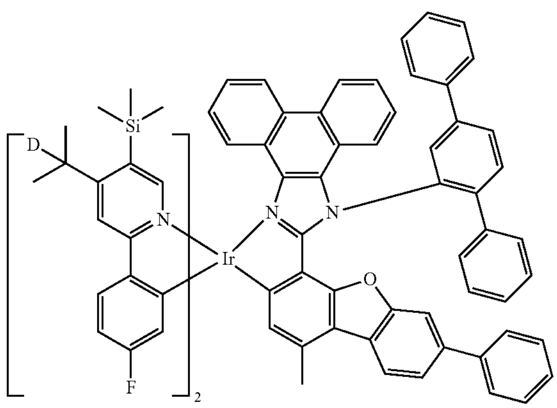
2318
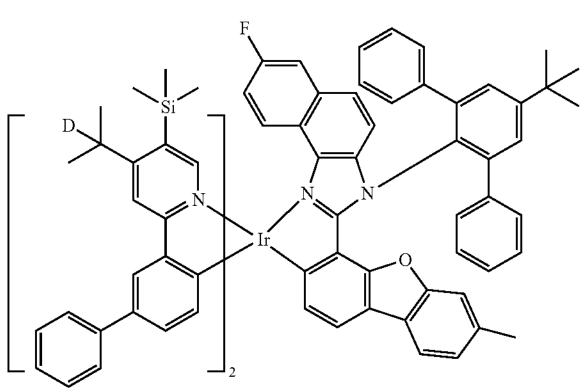
-continued
2319
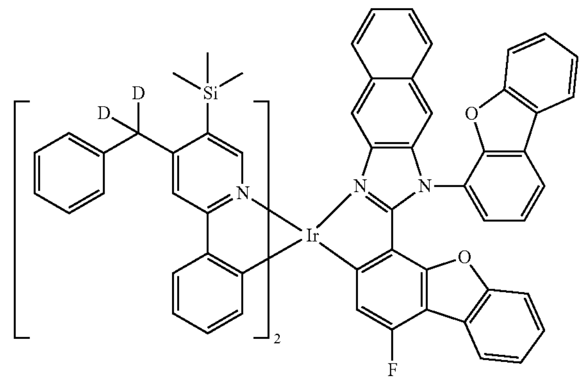
2320
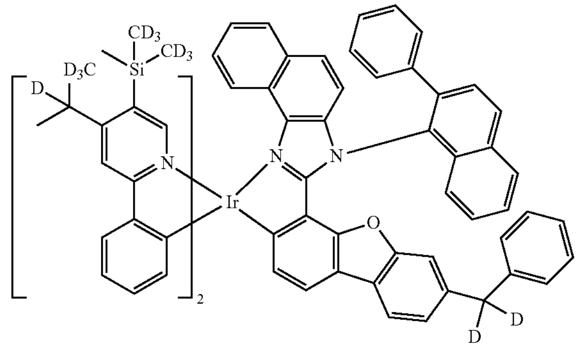
2321
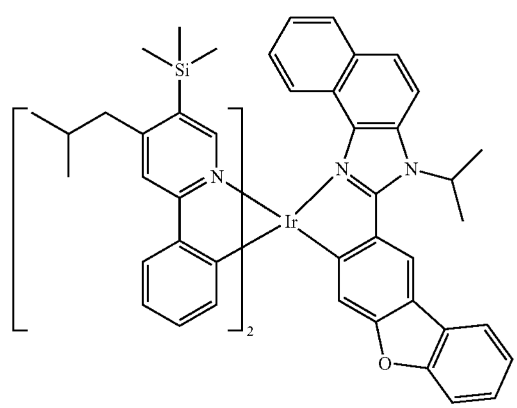

2322
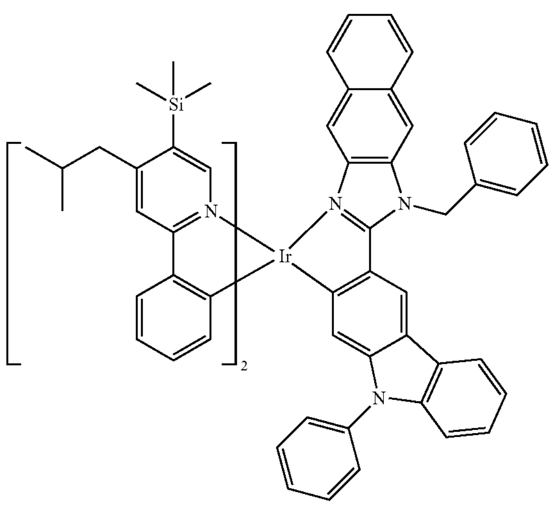
2323
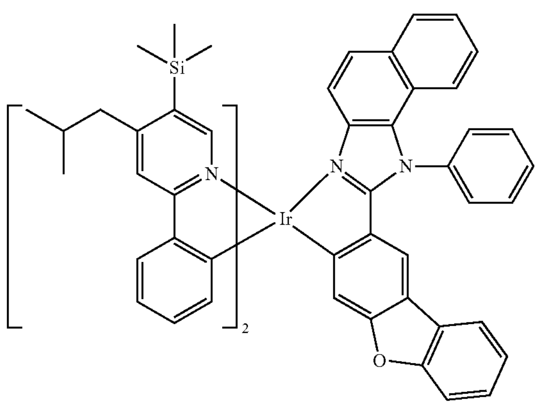
2324
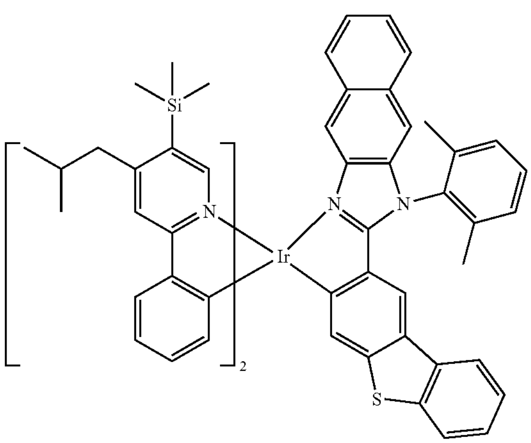
2325
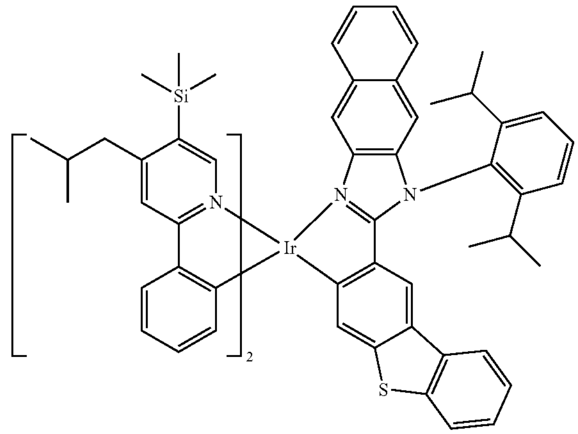
2326
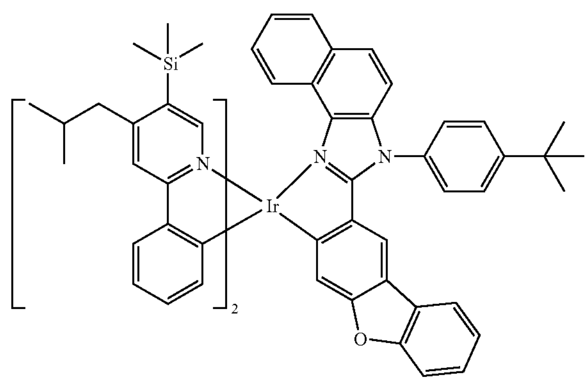
2327
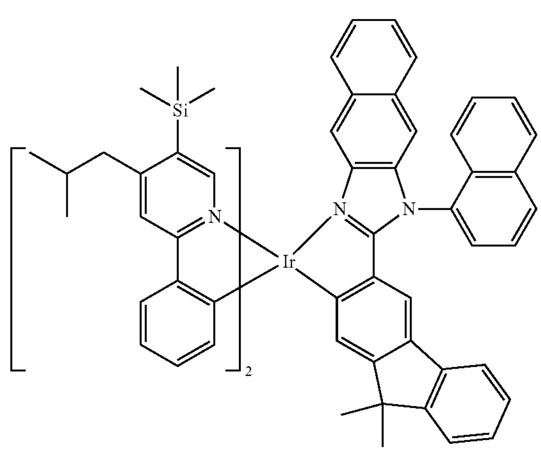

-continued
2328
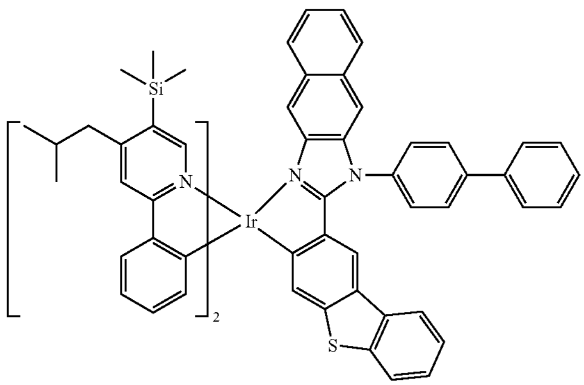
2329
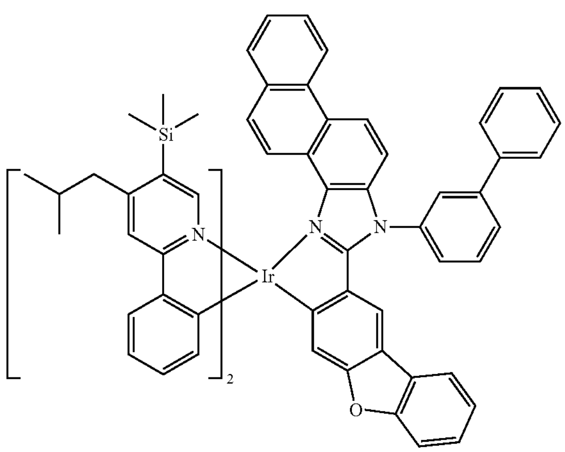
2330
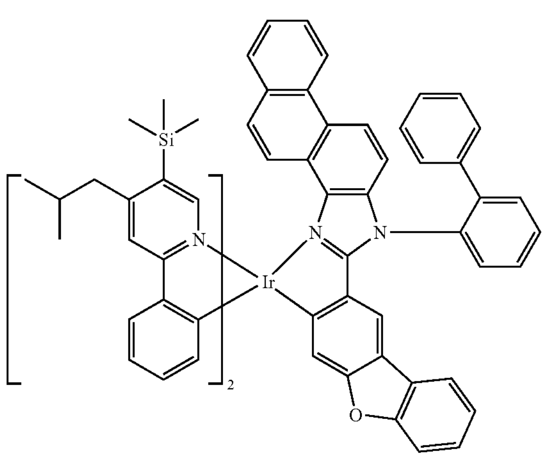
-continued
2331
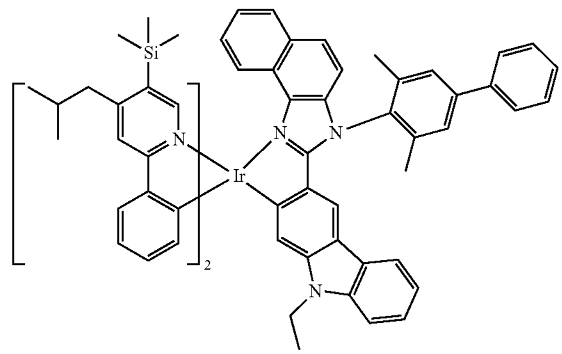
2332
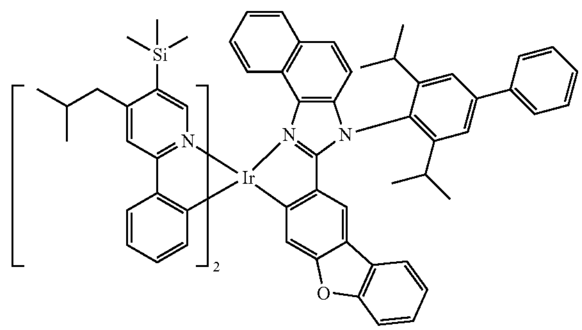
2333
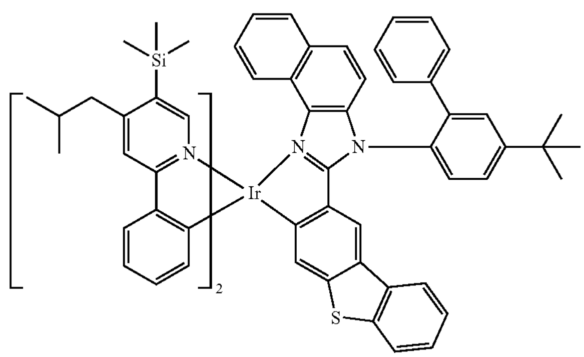
2334
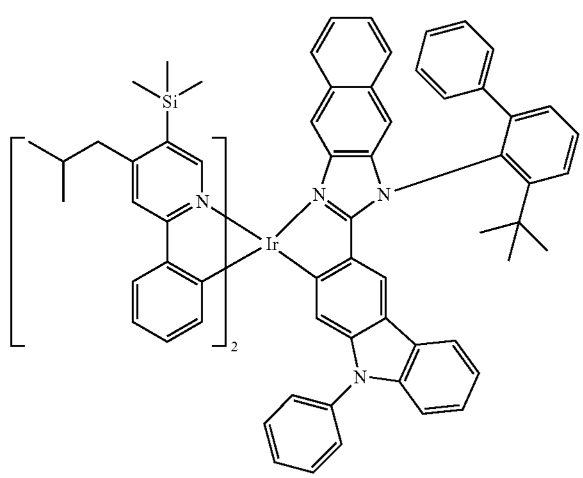

-continued
2335
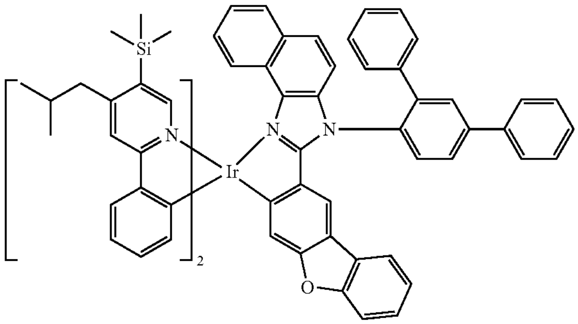
2336
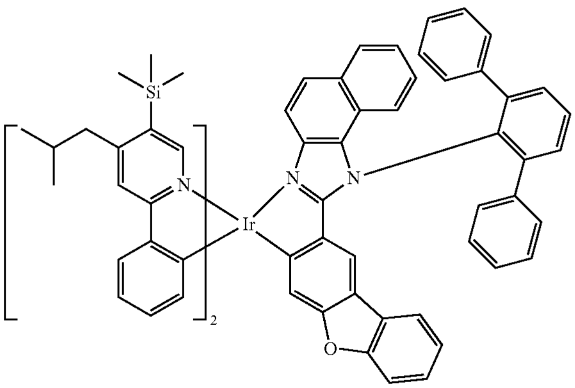
2337
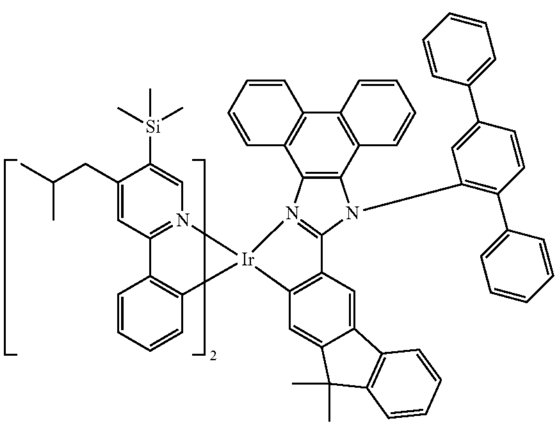
2338
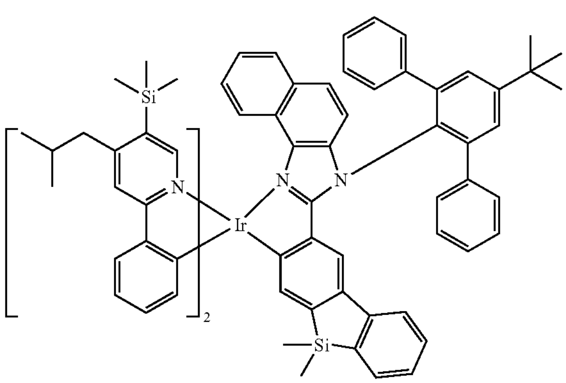
-continued
2339
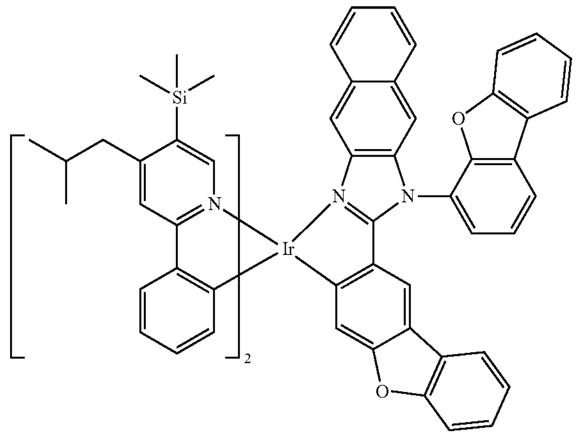
2340
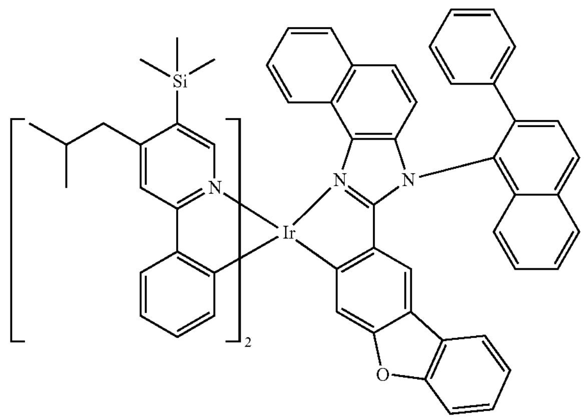
2341
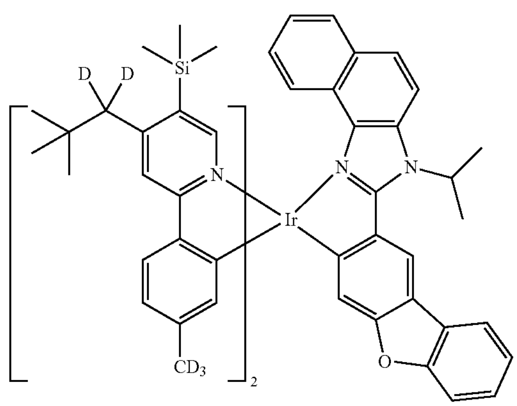

727
-continued
2342
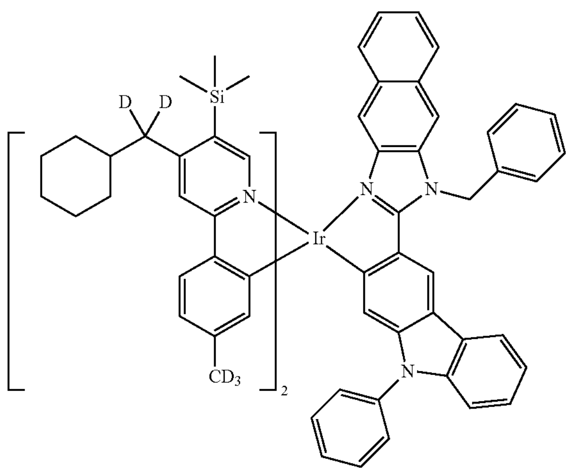
2343
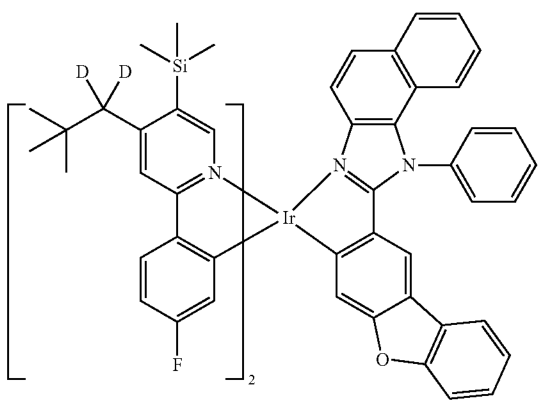
2344
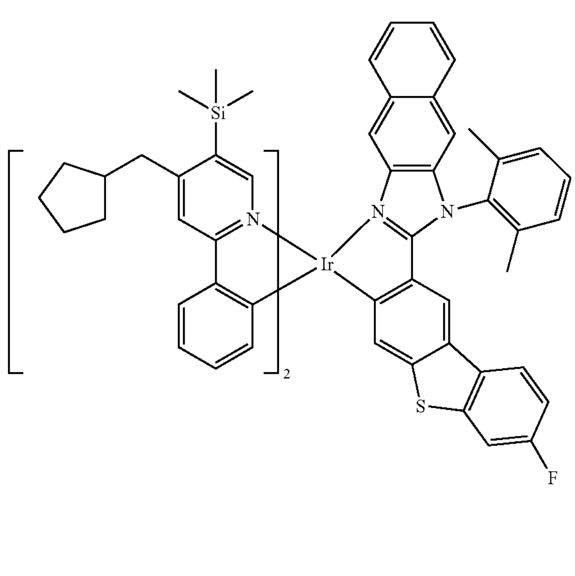
728
-continued
2345
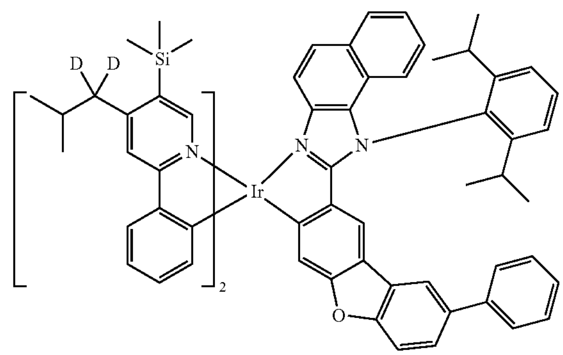
2346
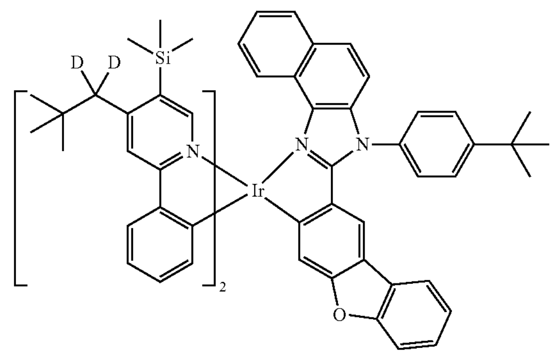
2347
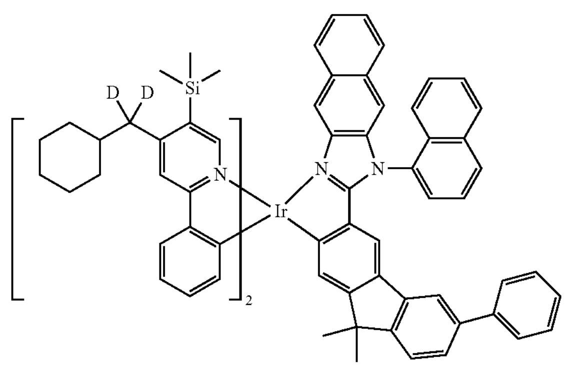
2348
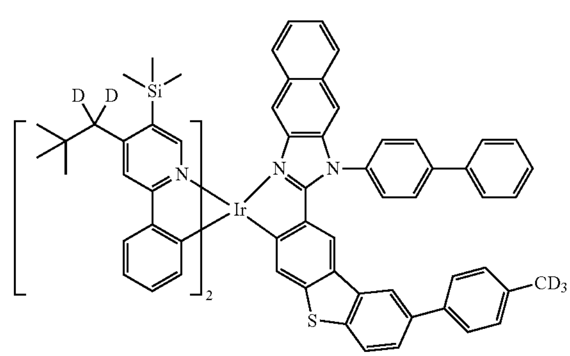

2349
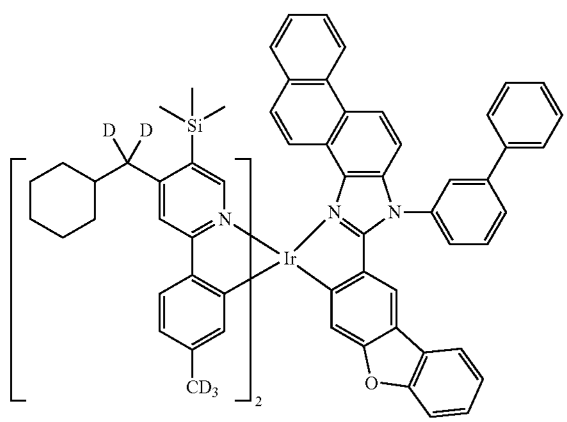
2350
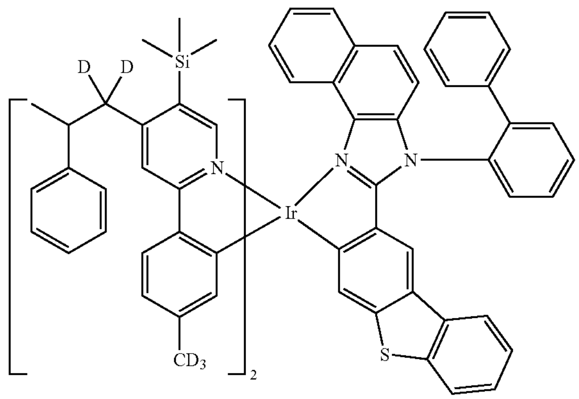
2351
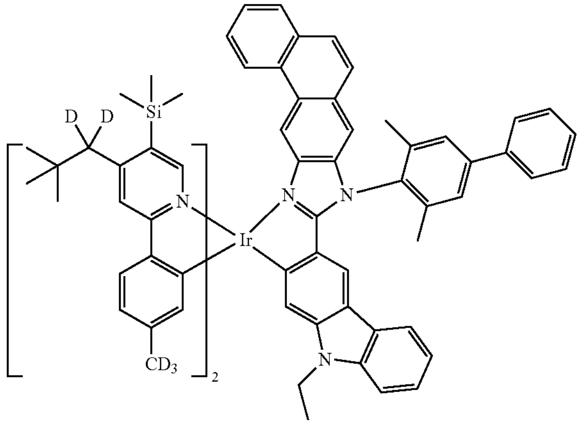
2352
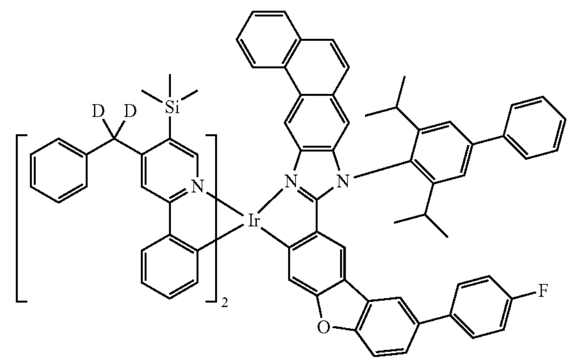
2353
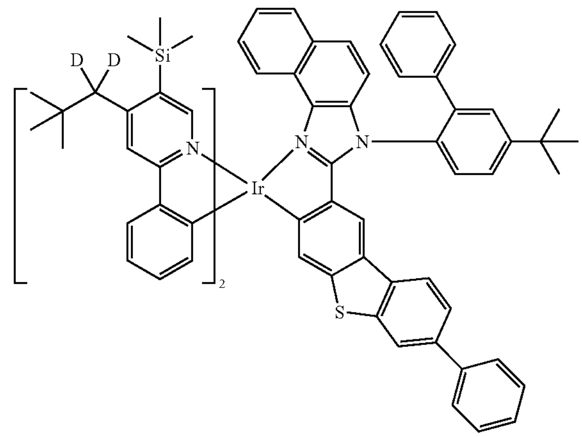
2354
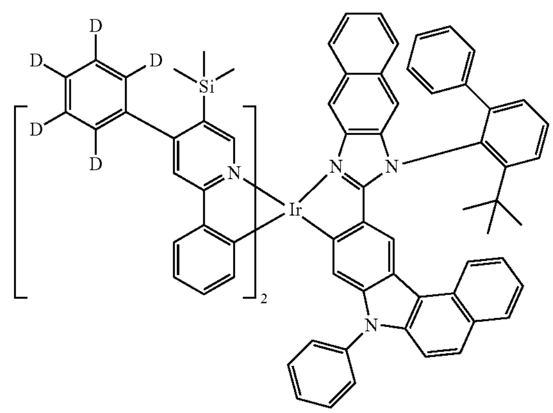
2355
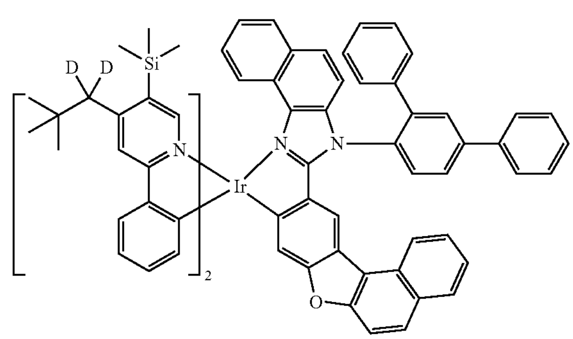

-continued
2356
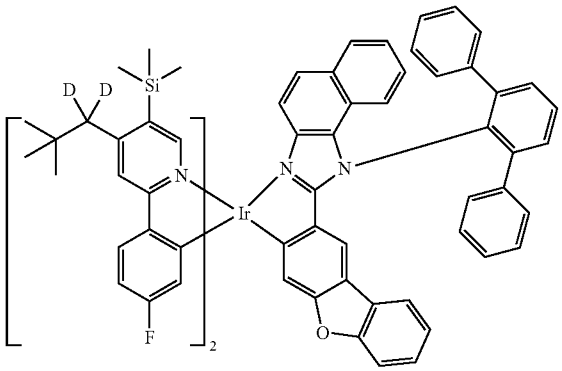
2357
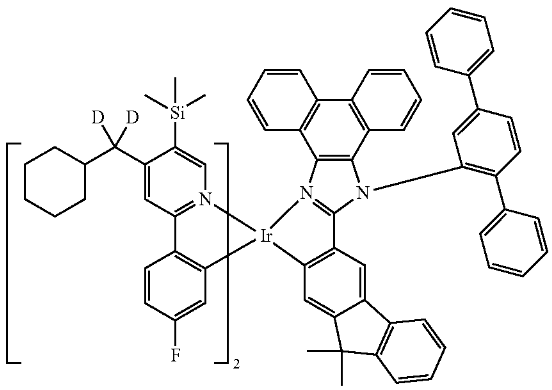
2358
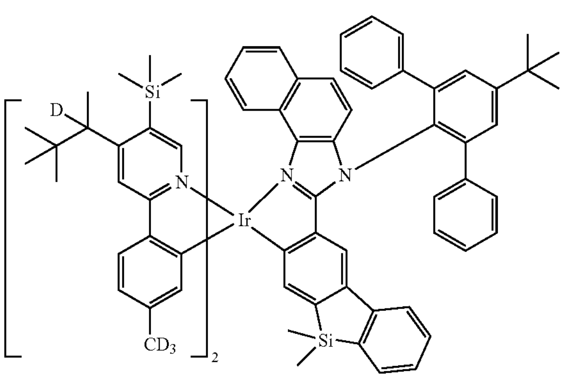
2359
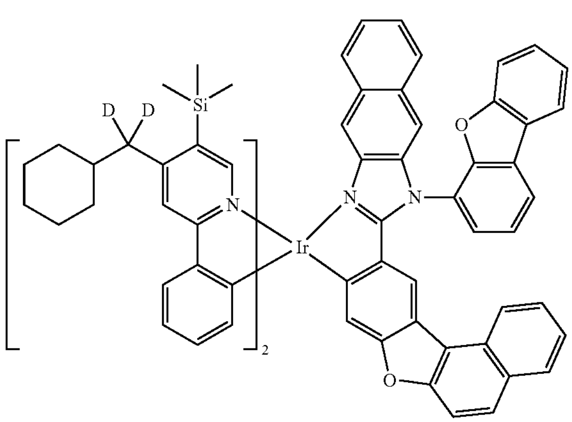
-continued
2360
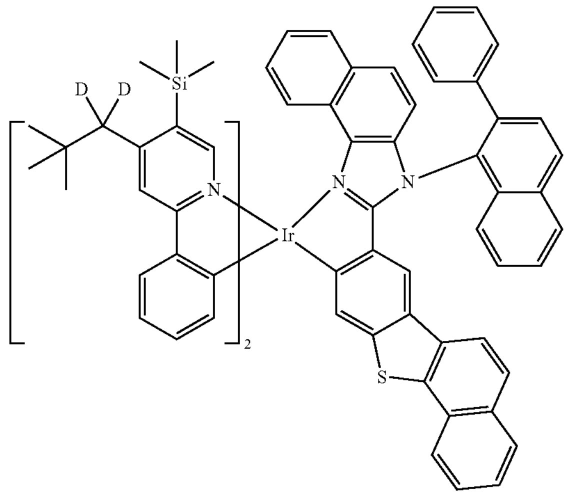
2361
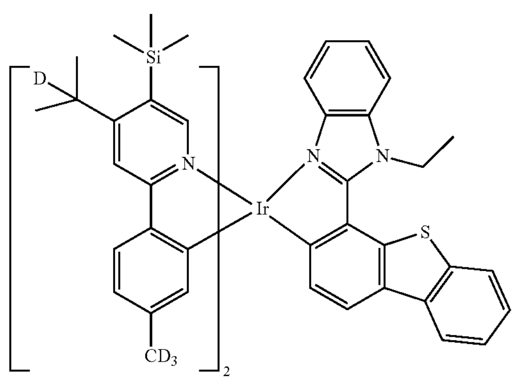
2362
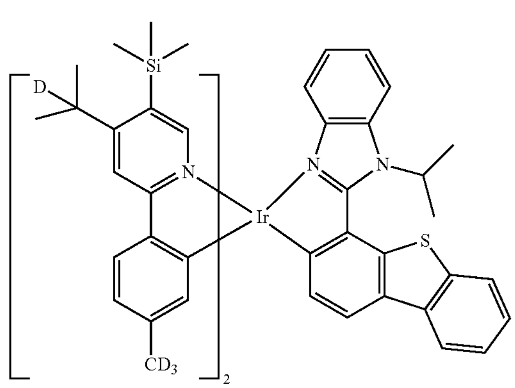

-continued
2363
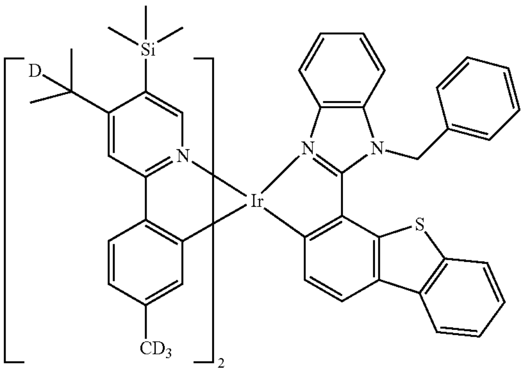
2364
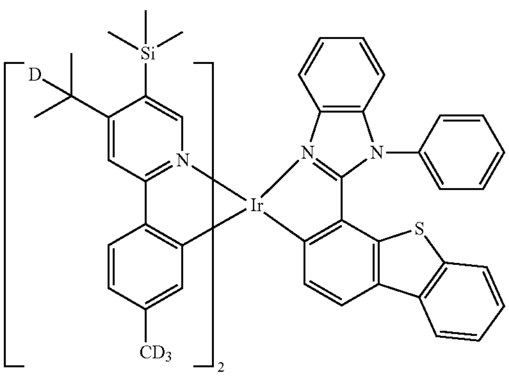
2365
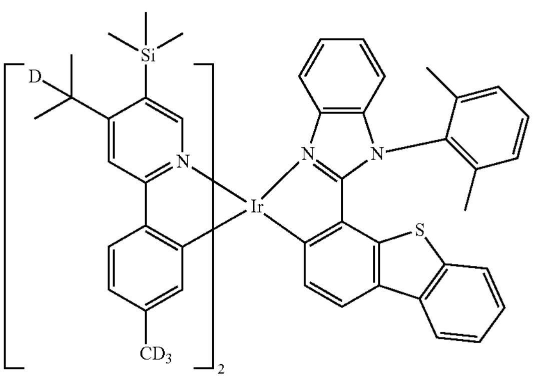
2366
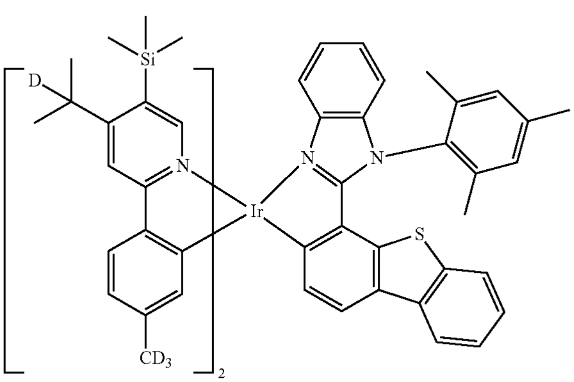
-continued
2367
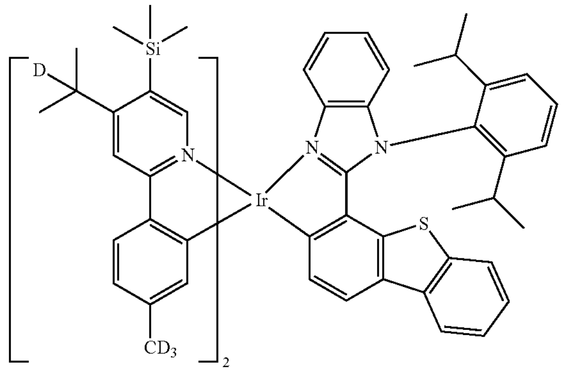
2368
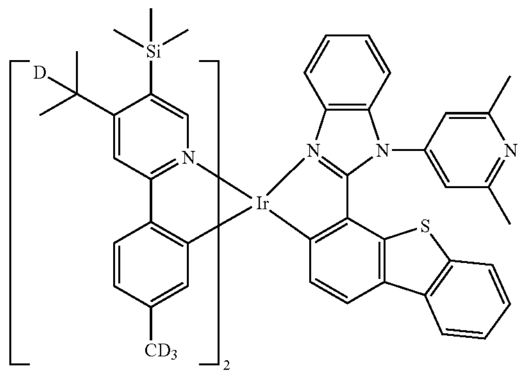
2369
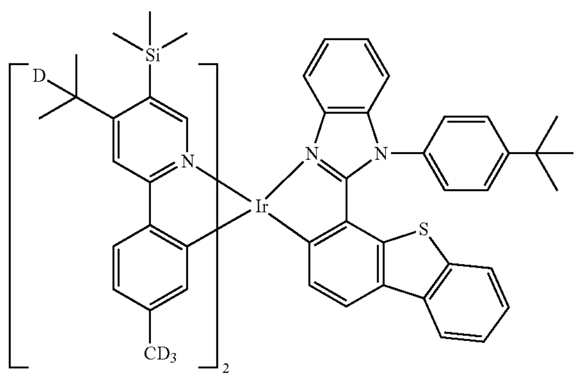
2370
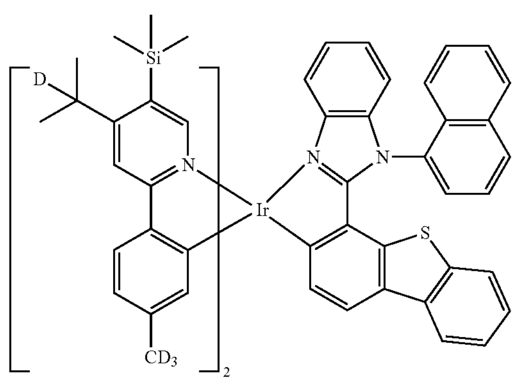

-continued
2371
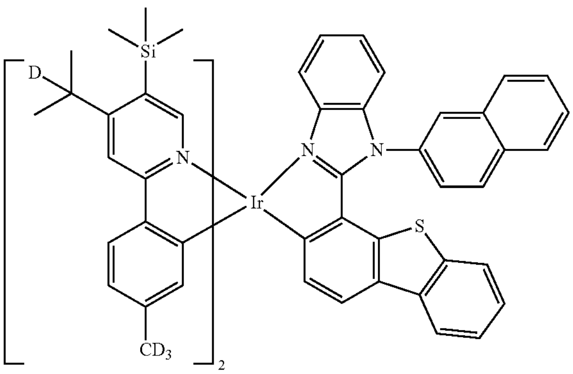
2372
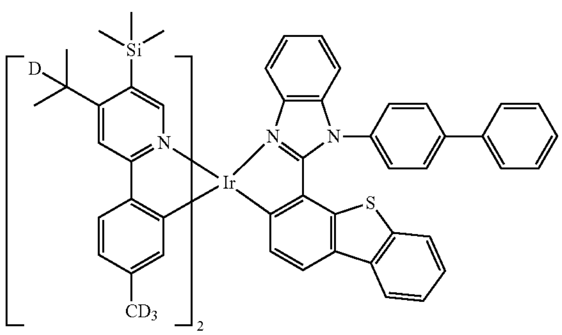
2373
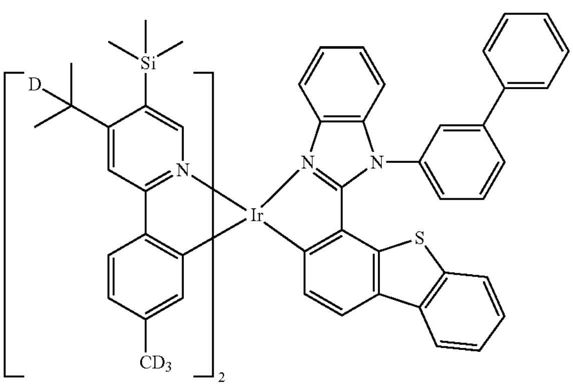
2374
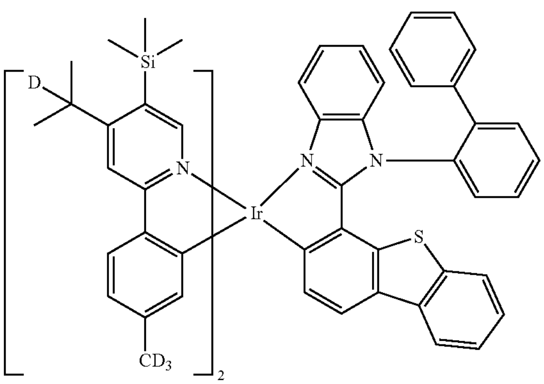
-continued
2375
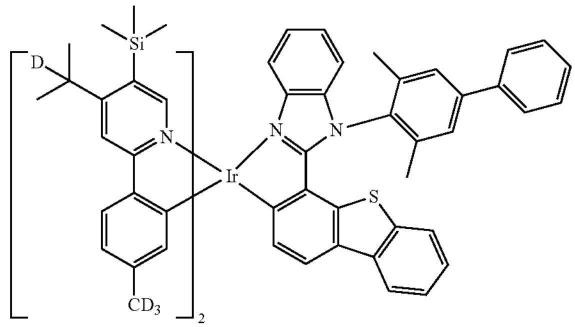
2376
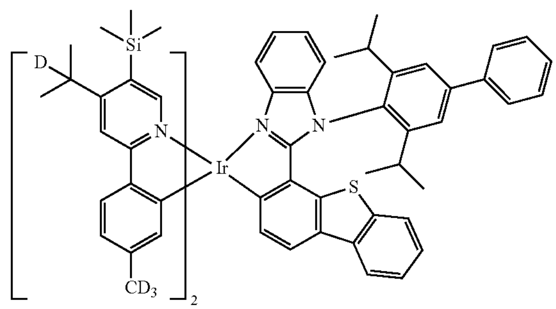
2377
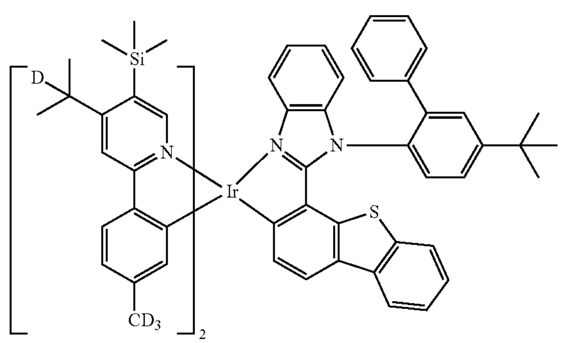
2378
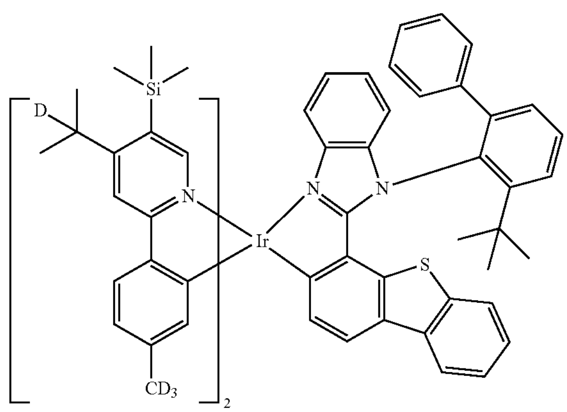

-continued
2379
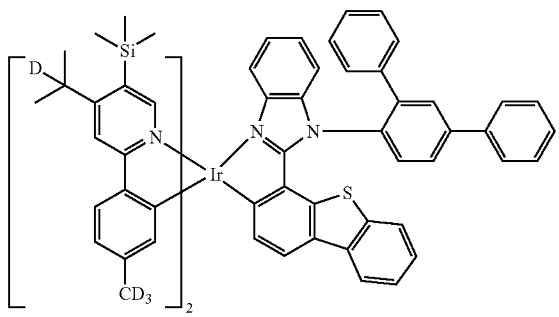
2380
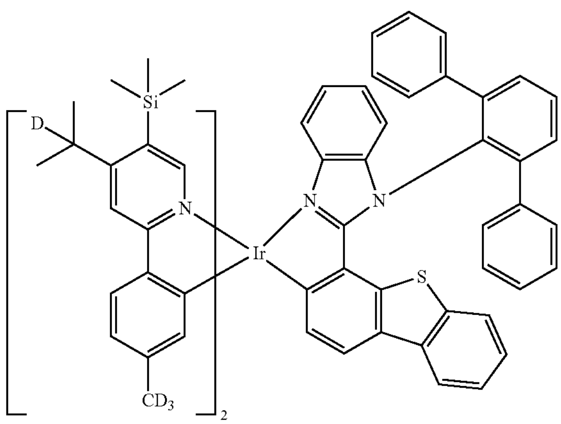
2381
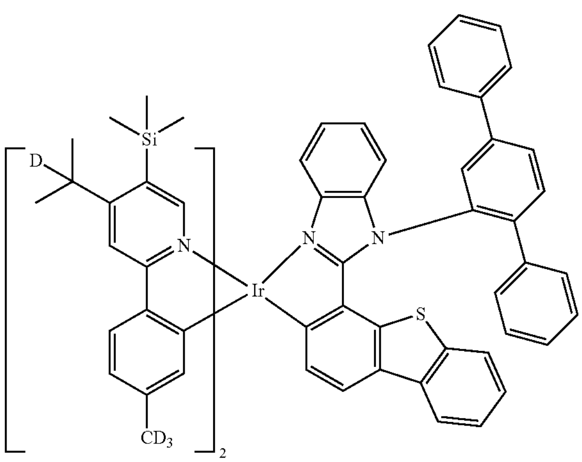
2382
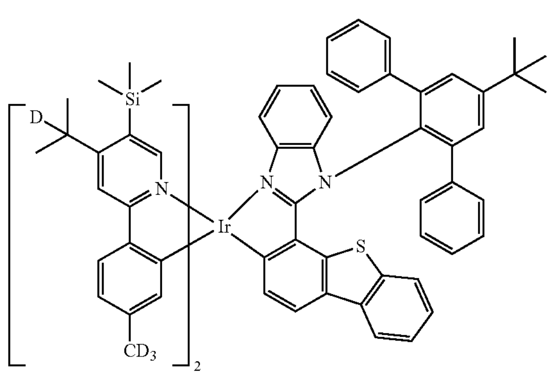
-continued
2383
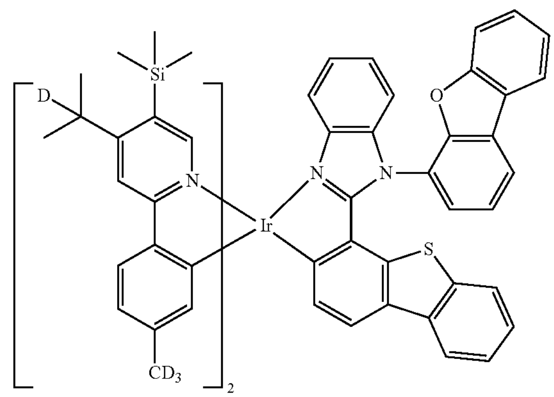
2384
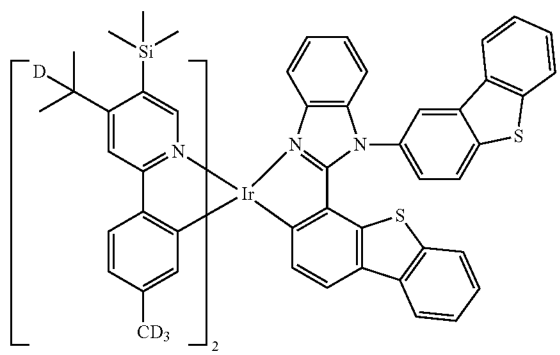
2385
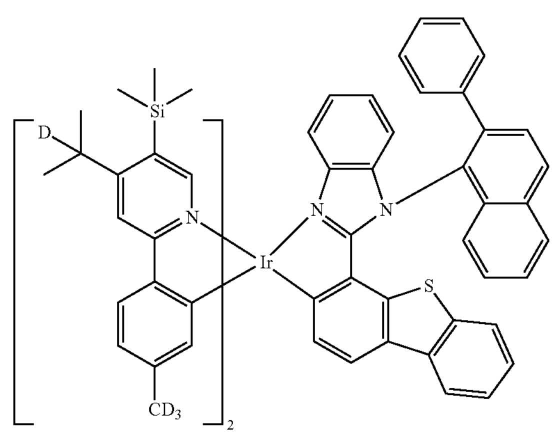
2386
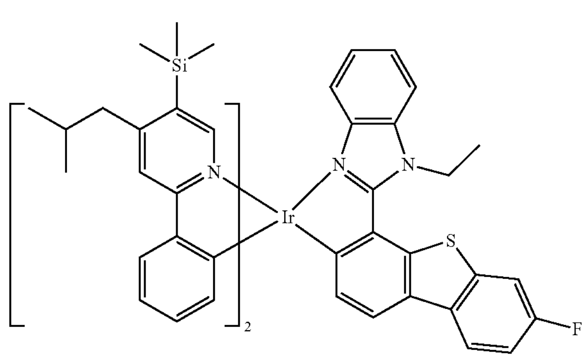

-continued
2387
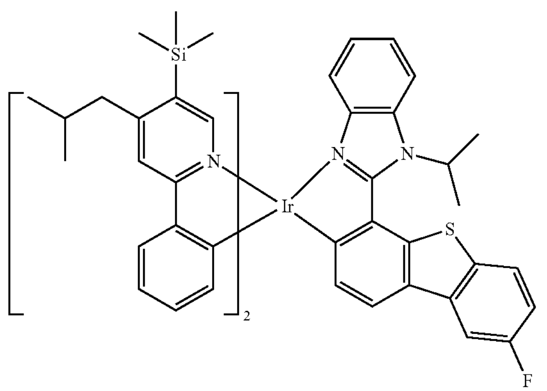
2388
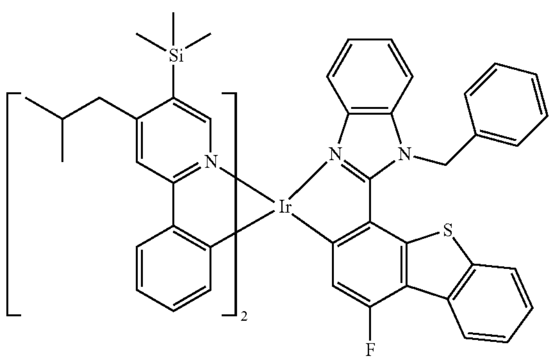
2389
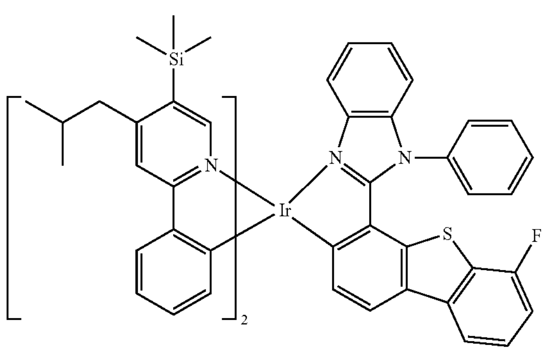
2390
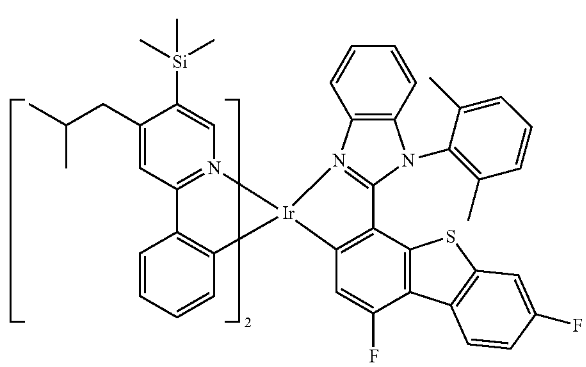
-continued
2391
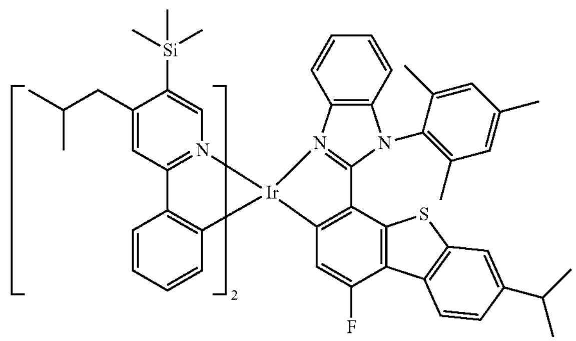
2392
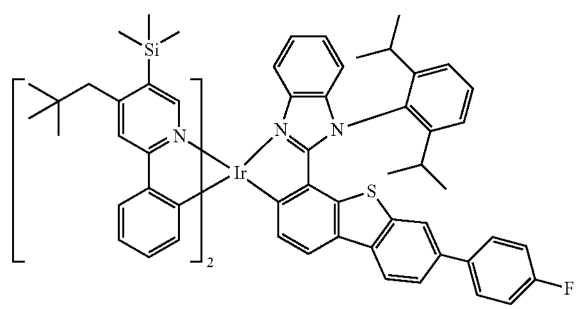
2393
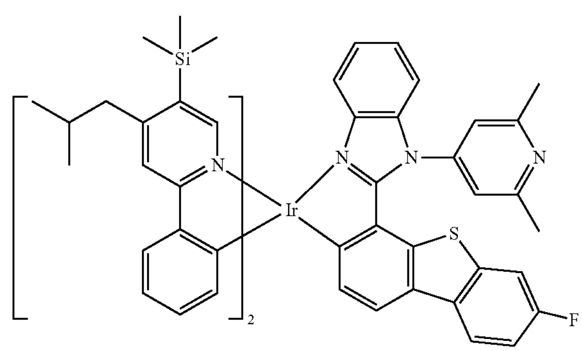
2394
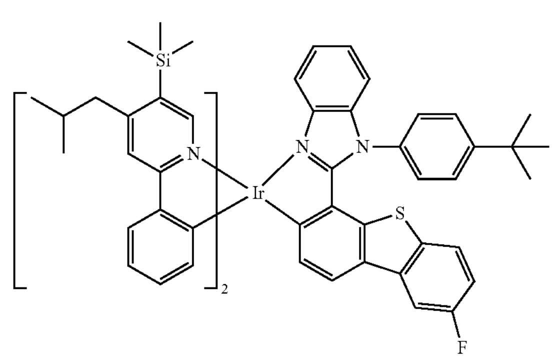

-continued
2395
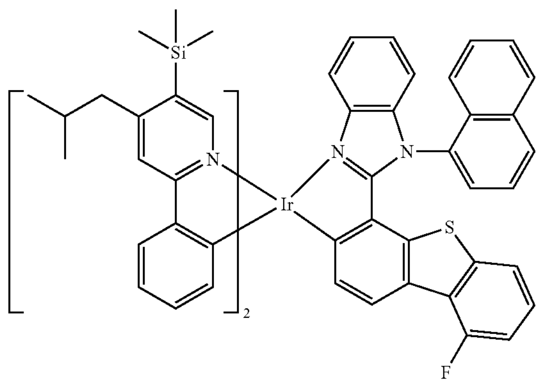
2396
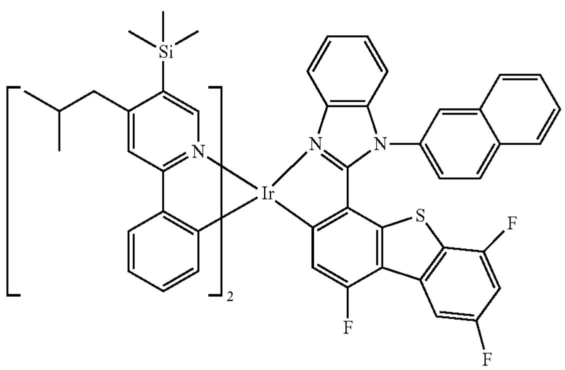
2397
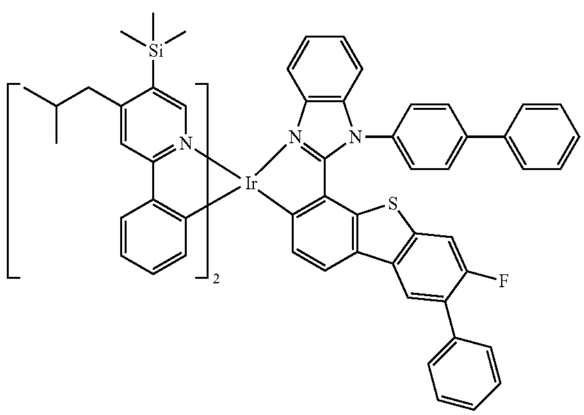
2398
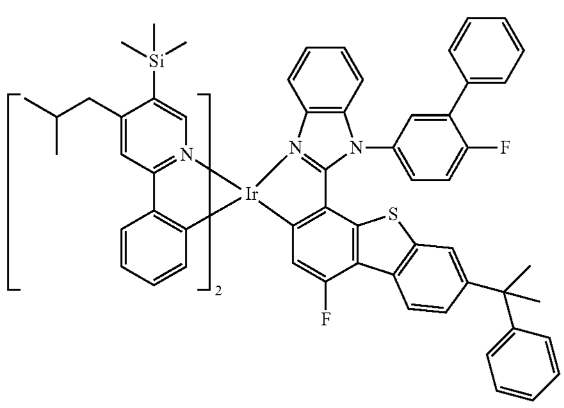
-continued
2399
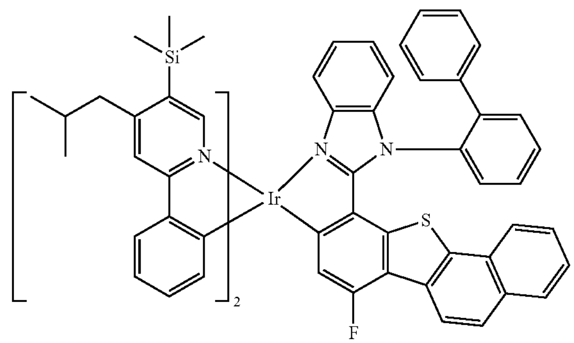
2400
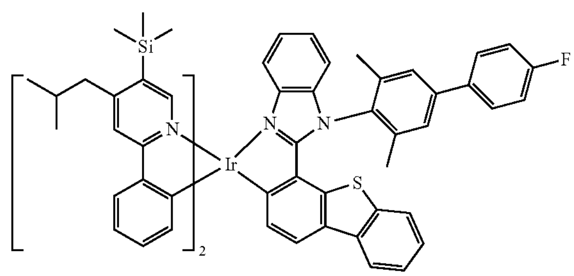
2401
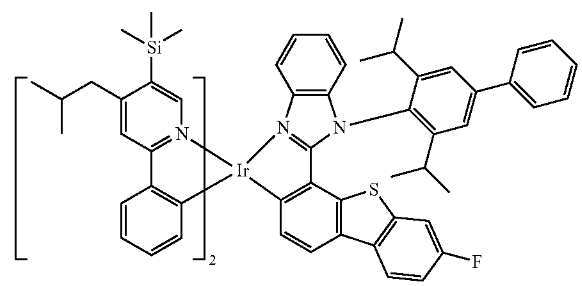
2402
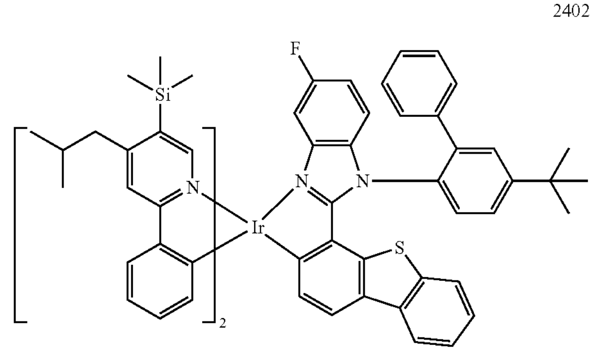

-continued
2403
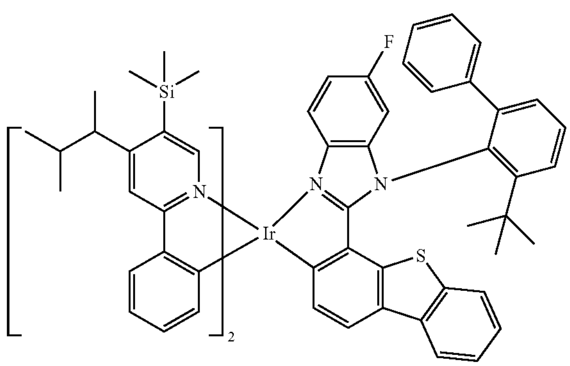
2404
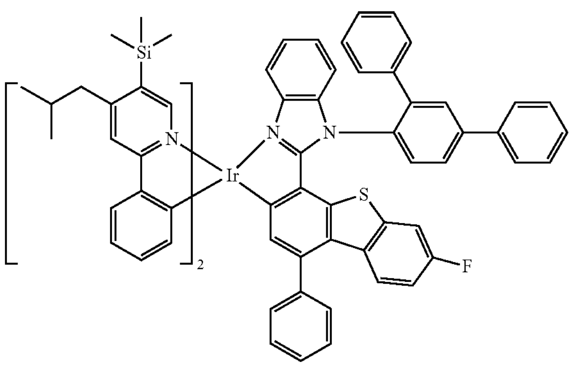
2405
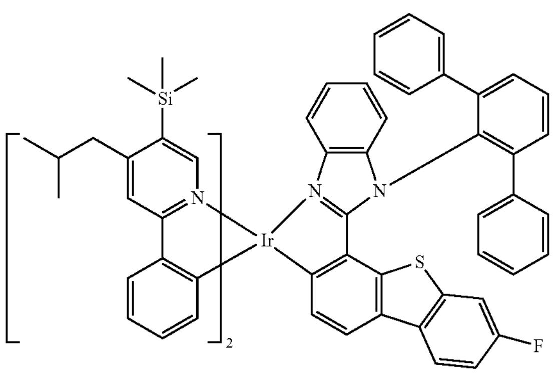
2406
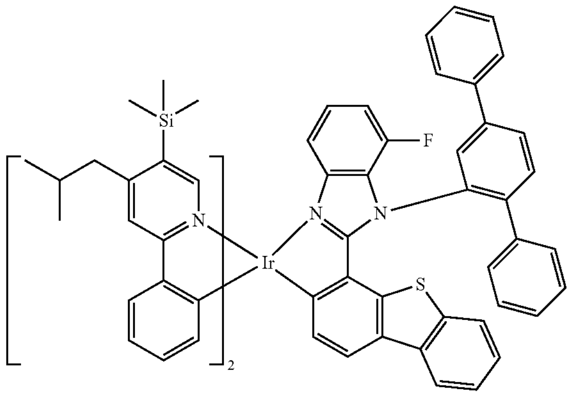
-continued
2407
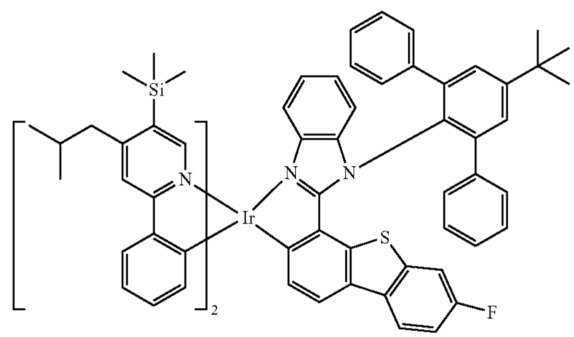
2408
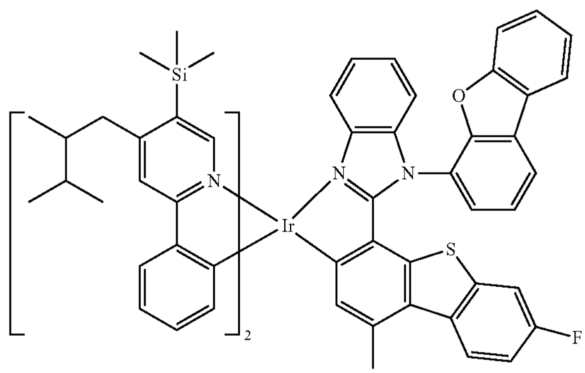
2409
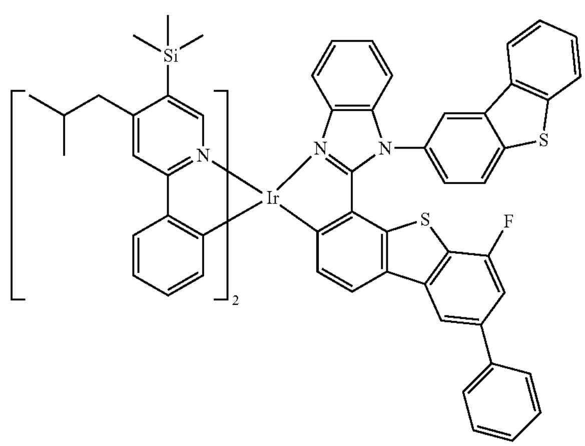
2410
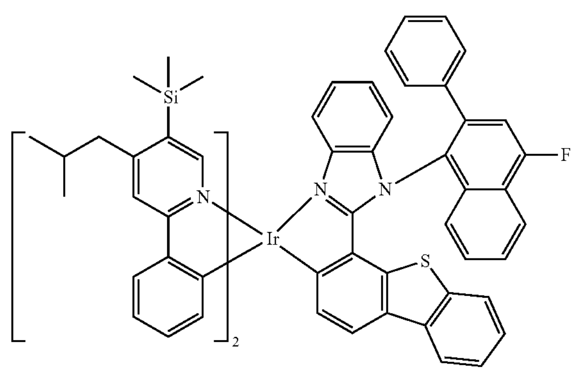

-continued
2411
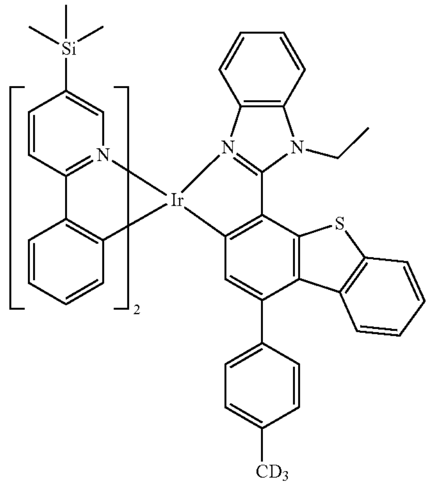
2412
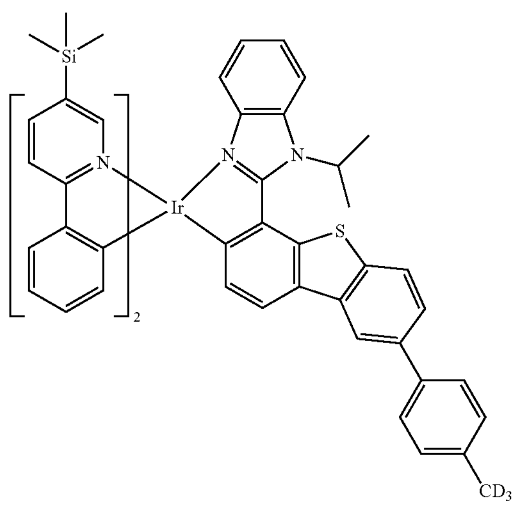
2413
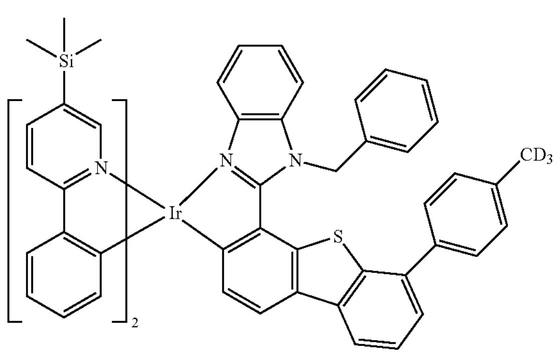
-continued
2414
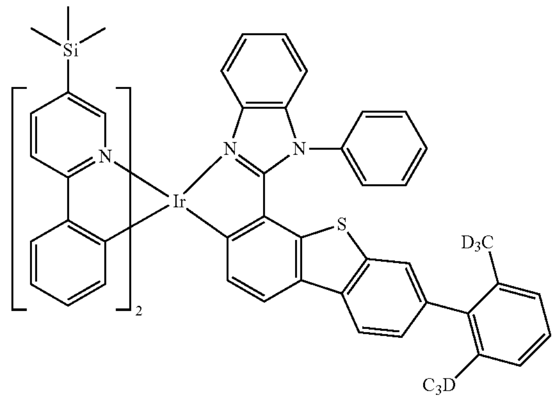
2415
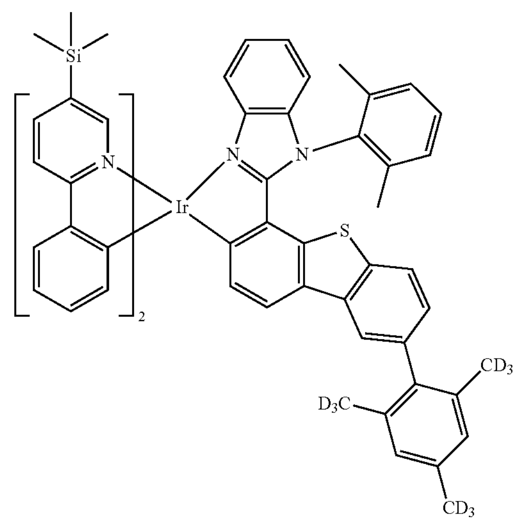
2416
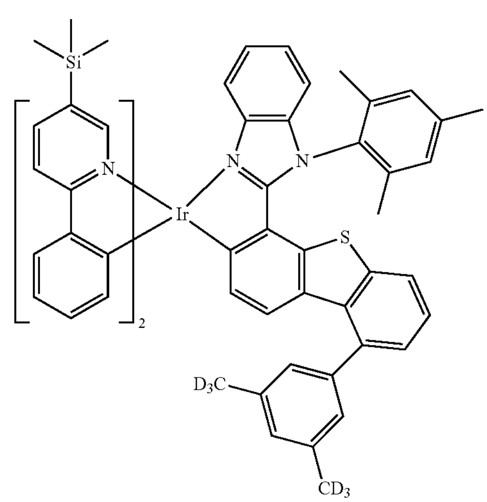

-continued
2417
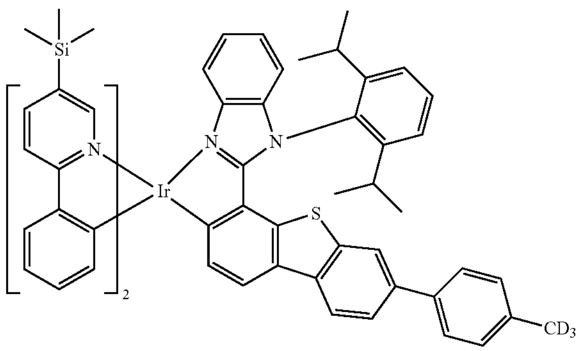
2418
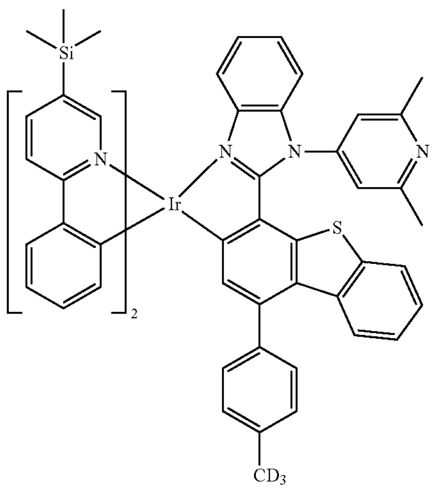
2419
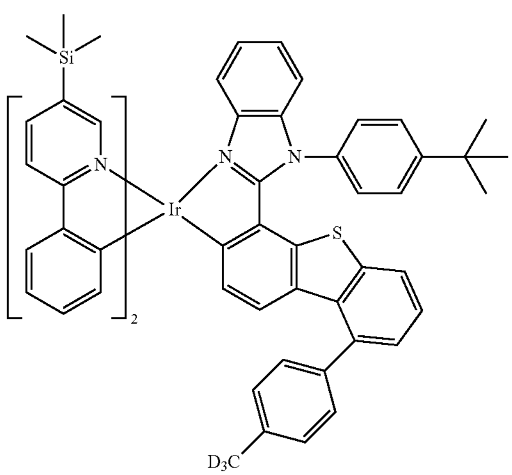
-continued
2420
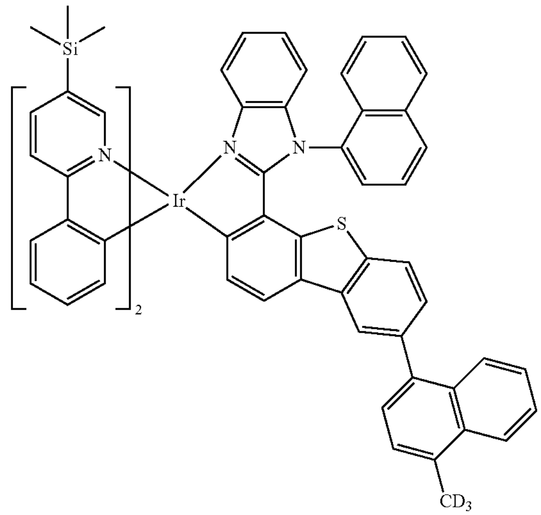
2421
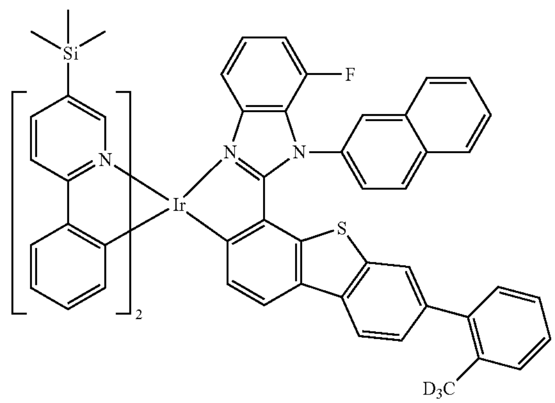
2422
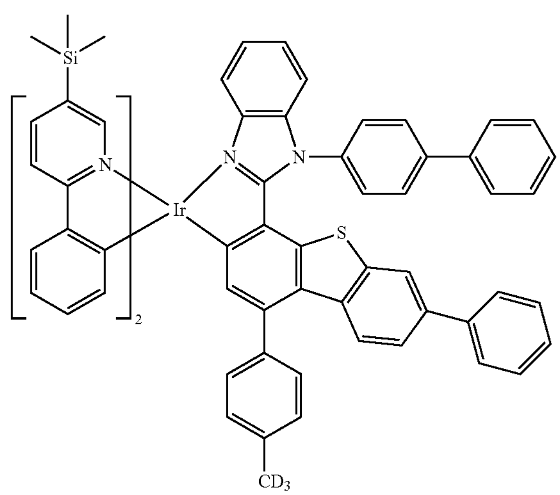

-continued
2423
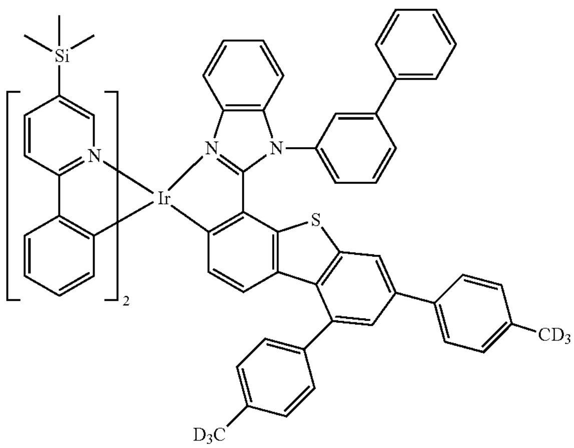
2424
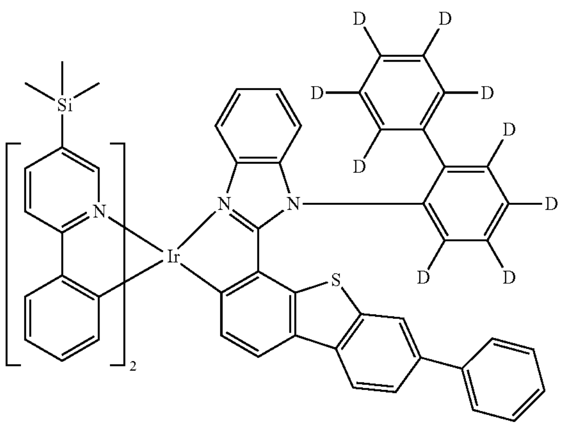
2425
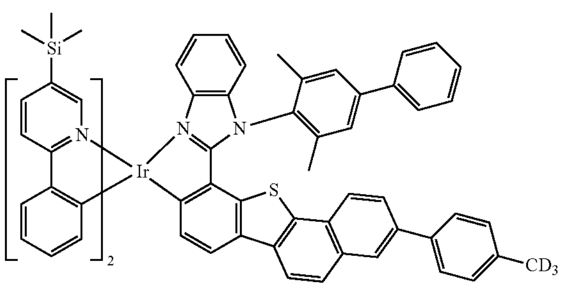
2426
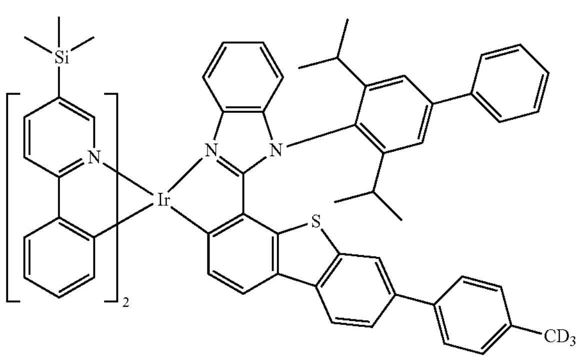
-continued
2427
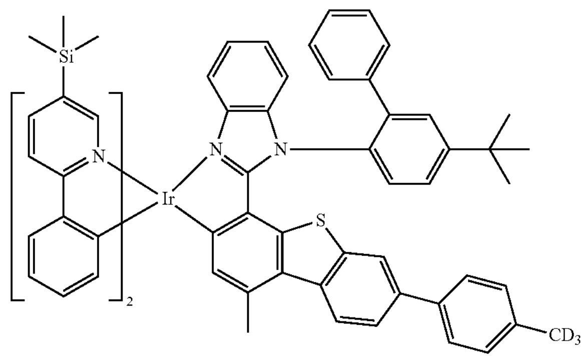
2428
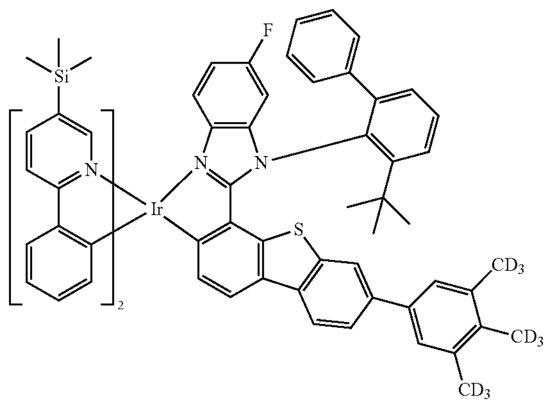
2429
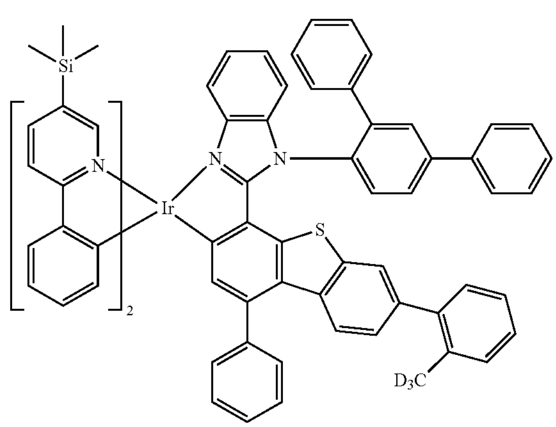

-continued
2430
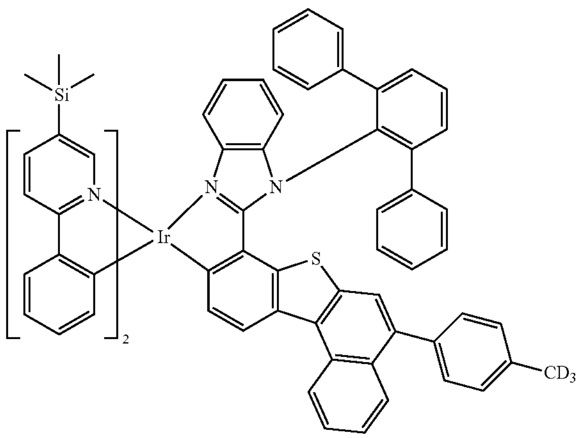
2431
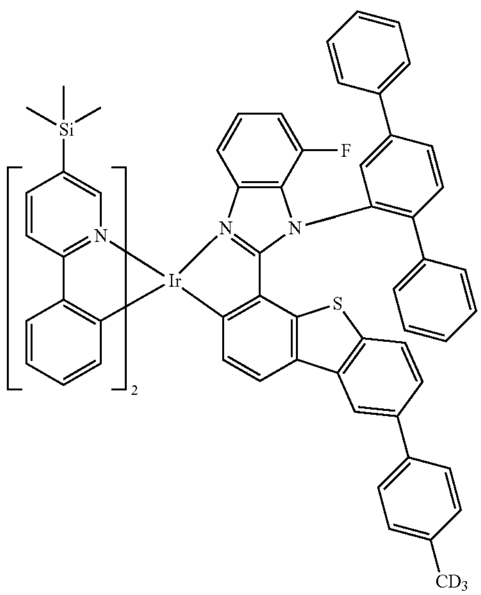
2432
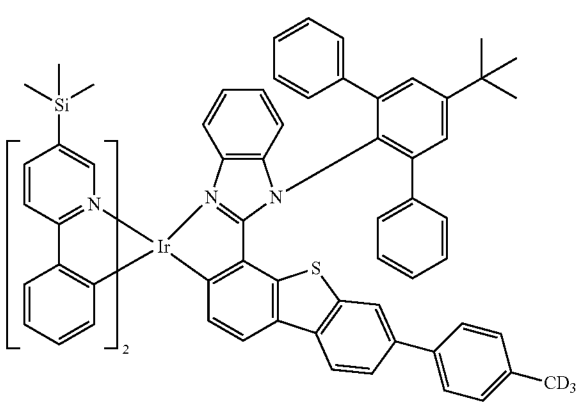
-continued
2433
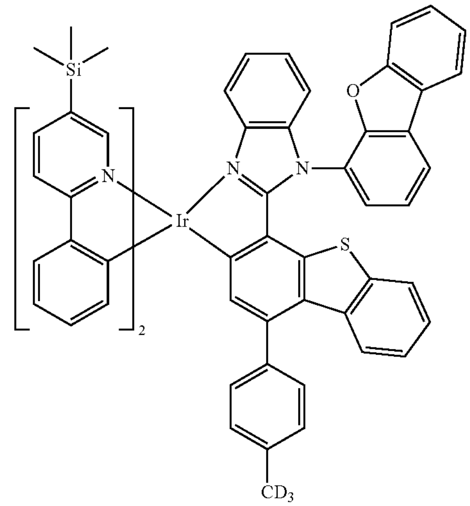
2434
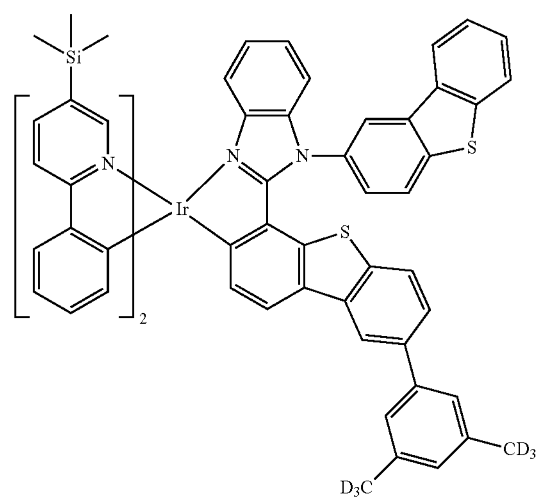
2435
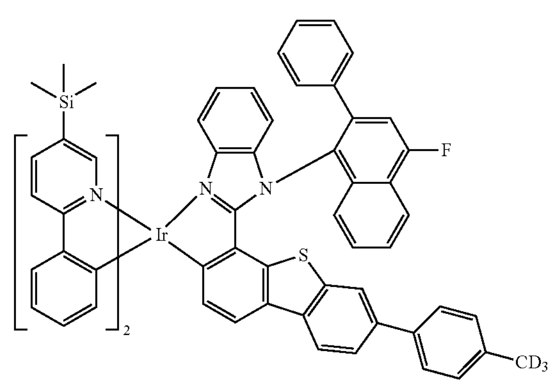

2436
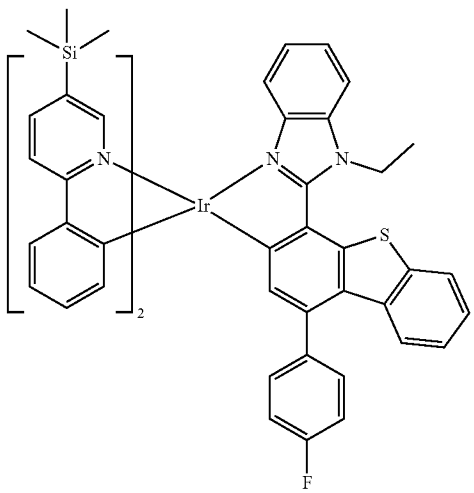
2437
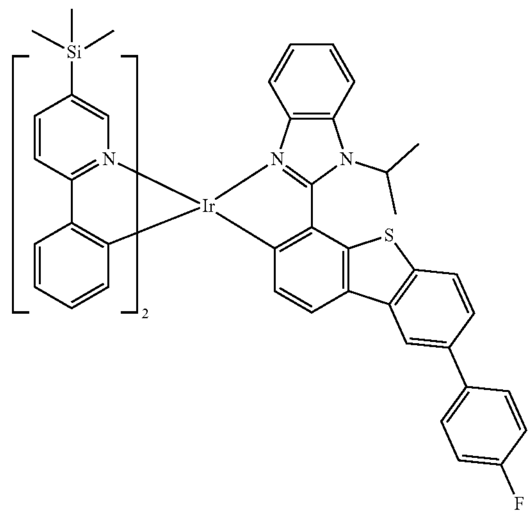
2438
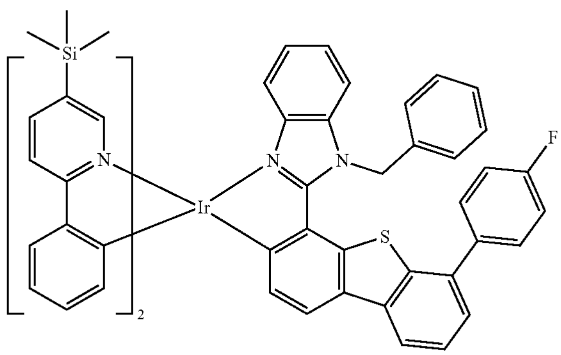
2439
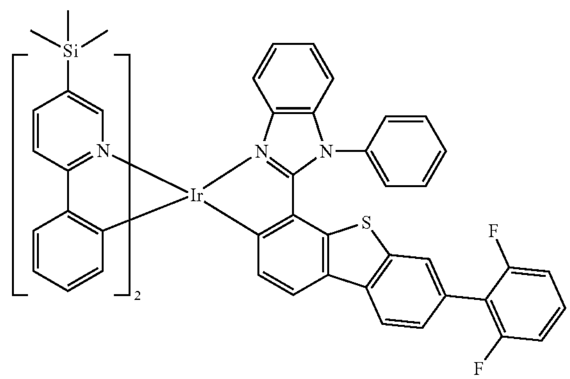
2440
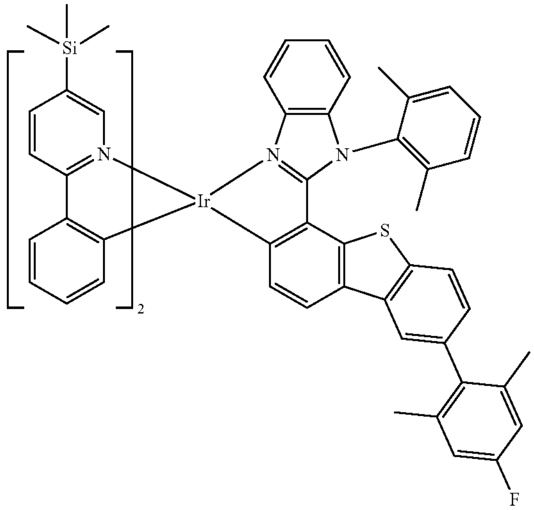
2441
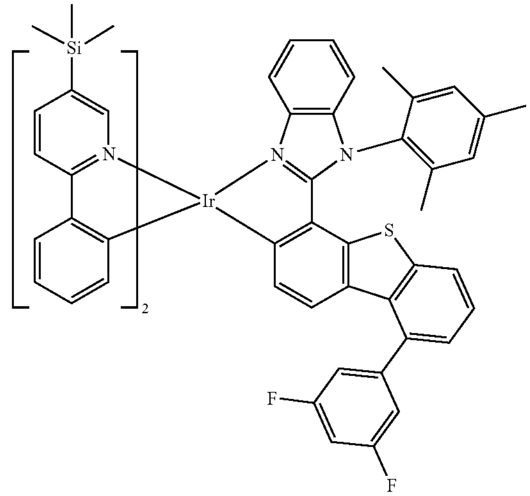

-continued
2442
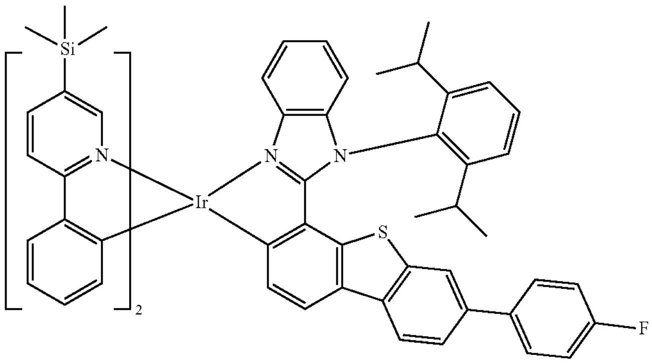
2443
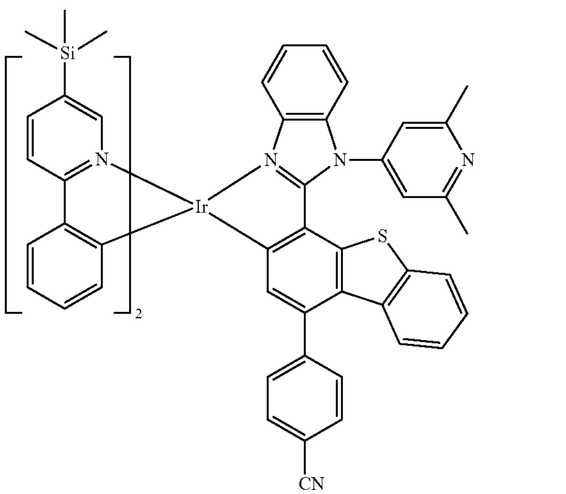
2444
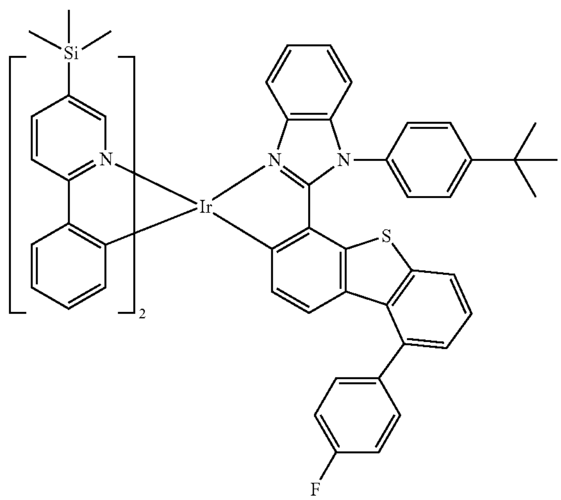
2445
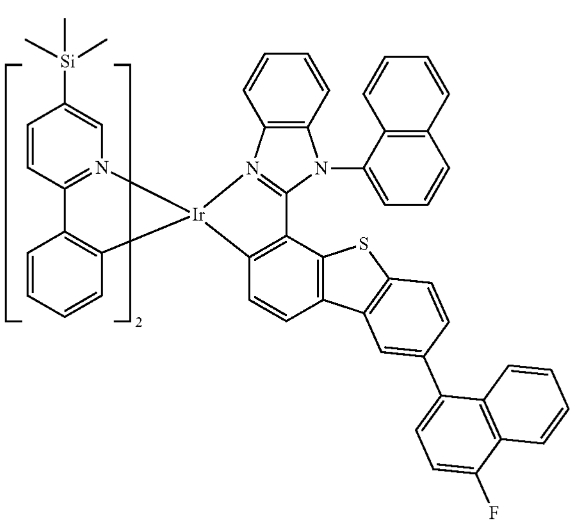

-continued
2446
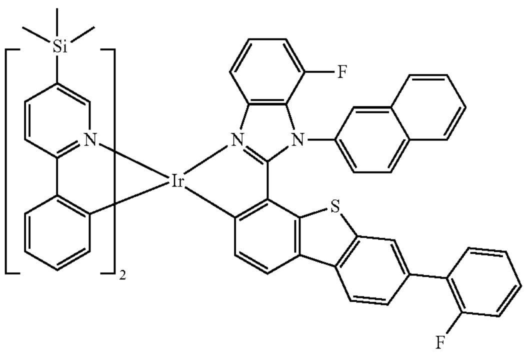
2447
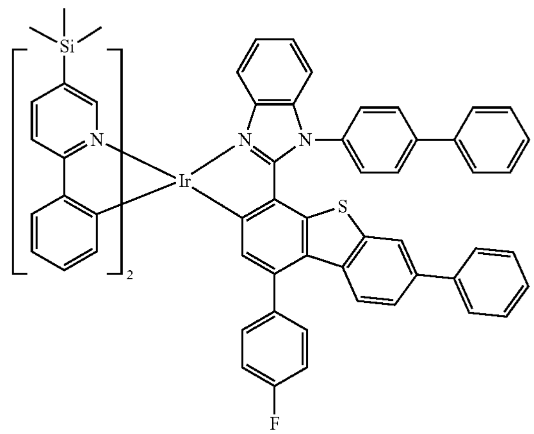
2448
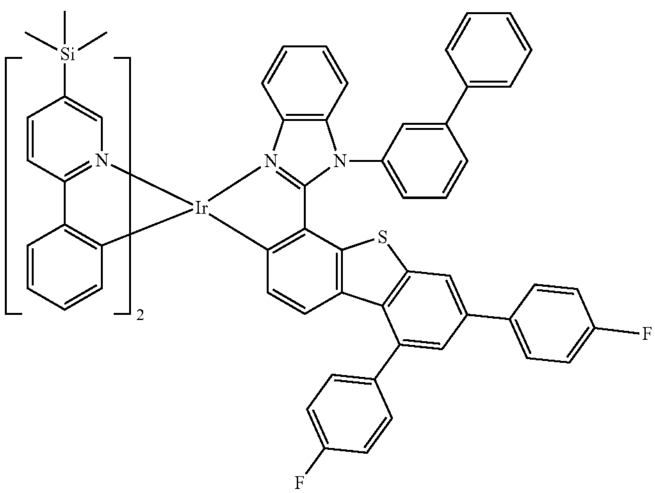
2449
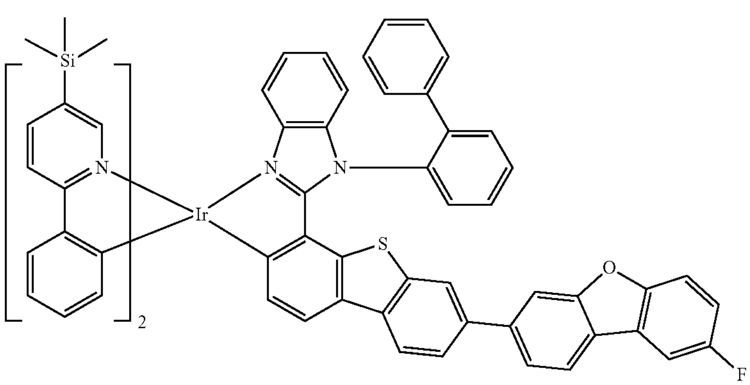

-continued
2450
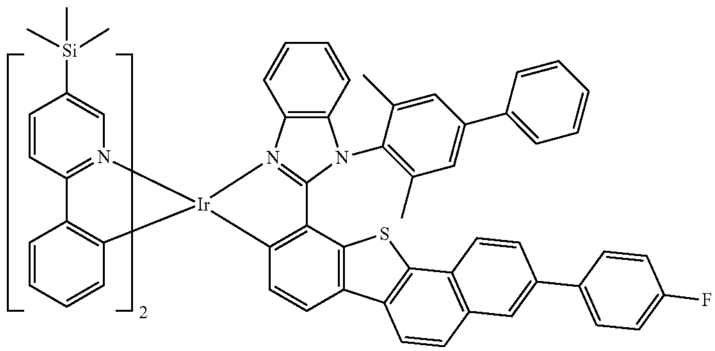
2451
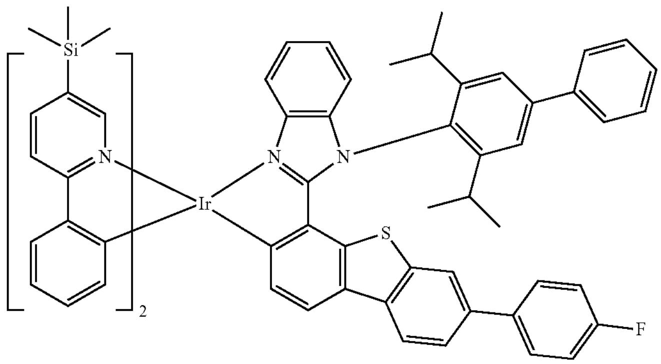
2452
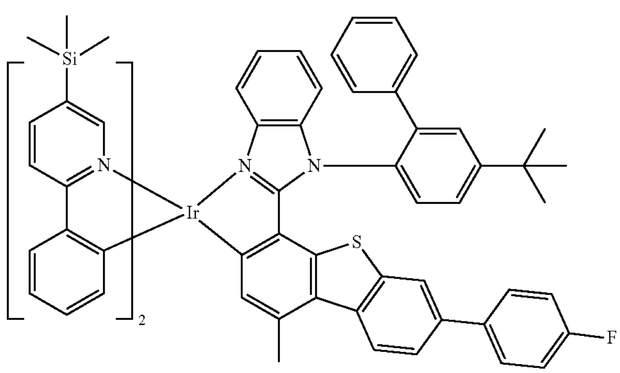
2453
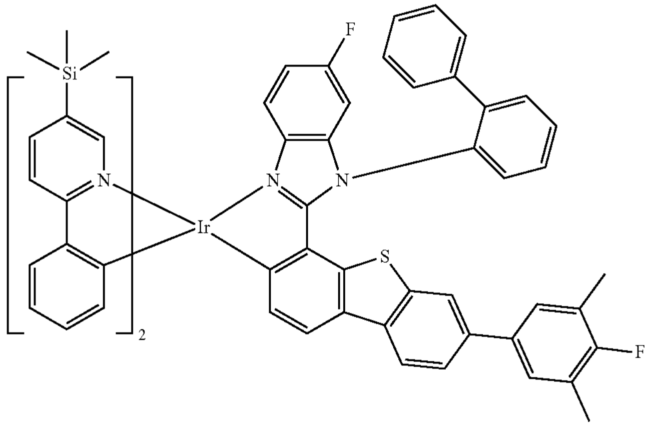

-continued
2454
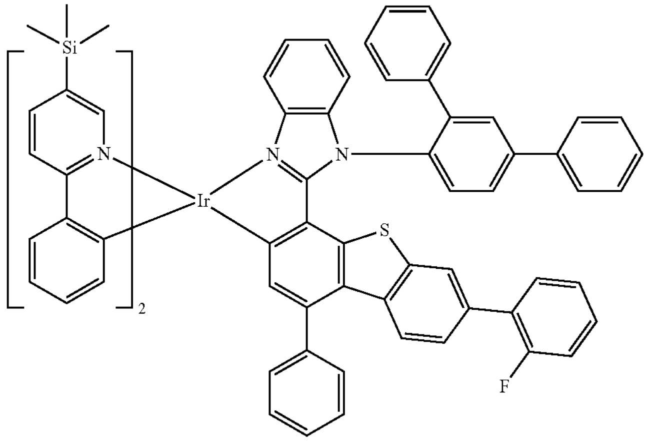
2455
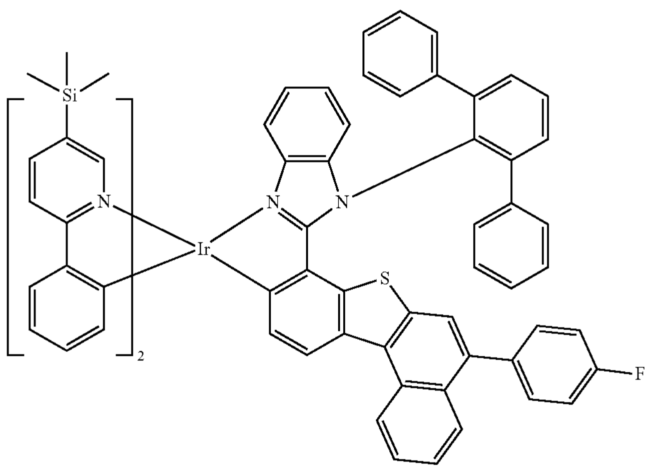
2456
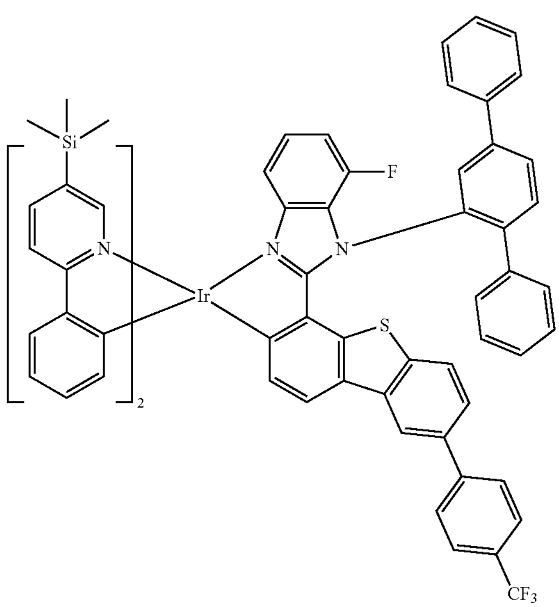

-continued
2457
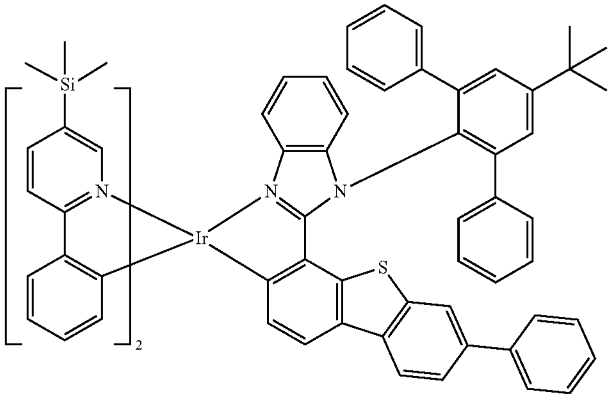
2458
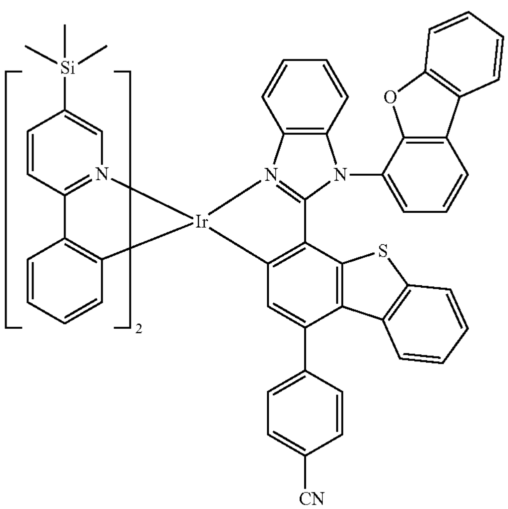
2459
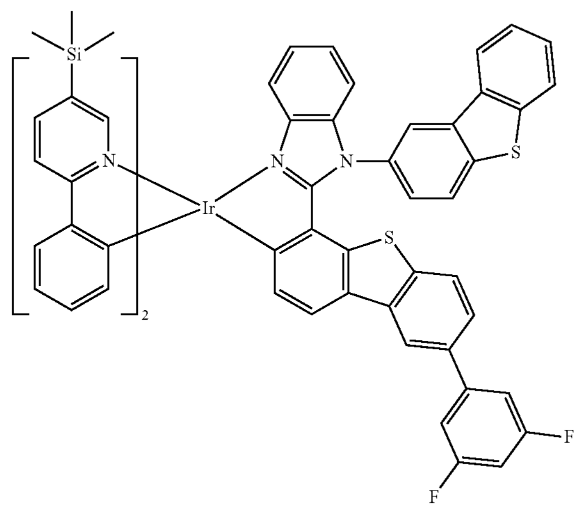
2460
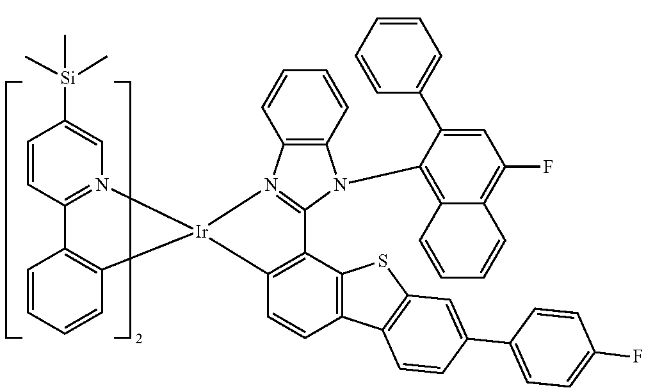

-continued
2461
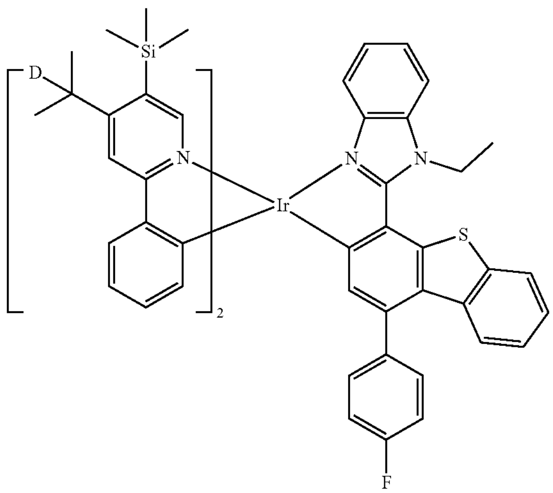
2462
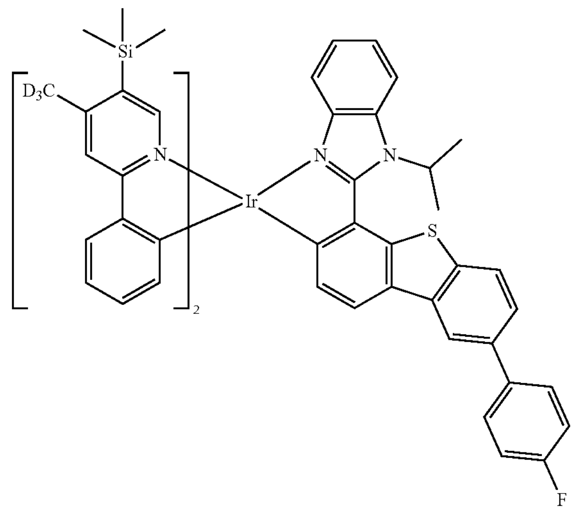
2463
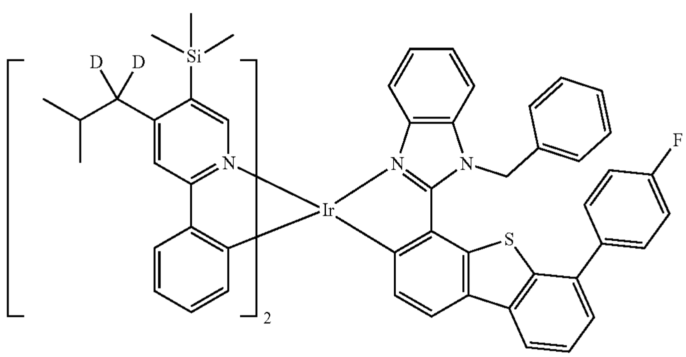
2464
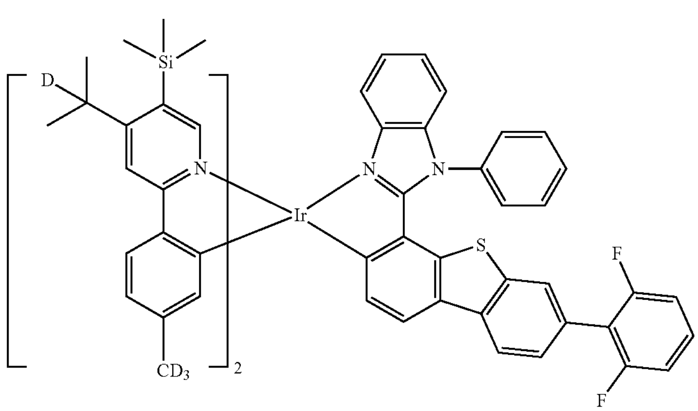

-continued
2465
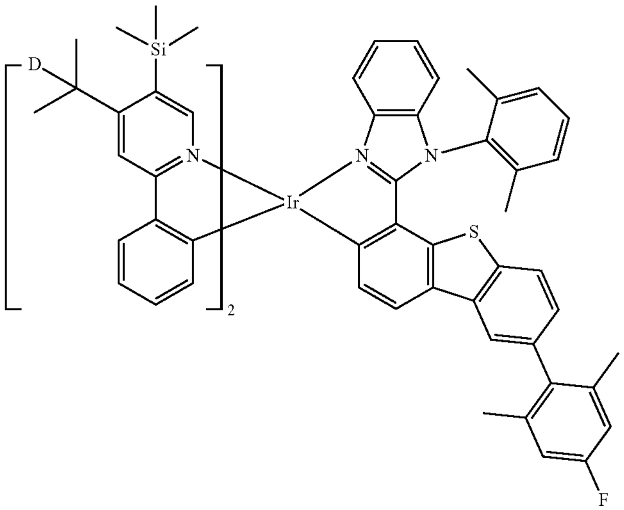
2466
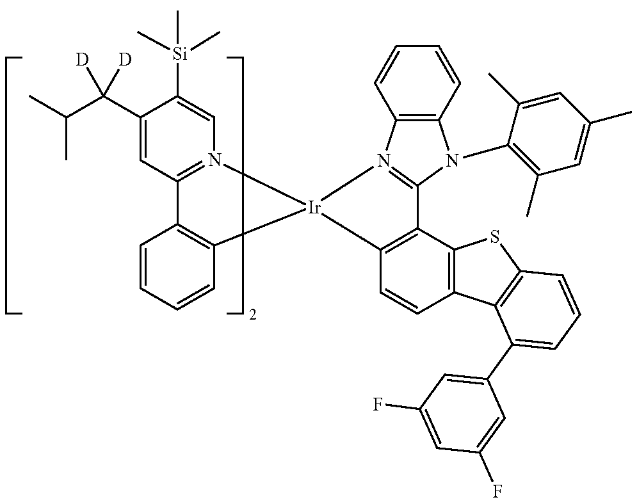
2467
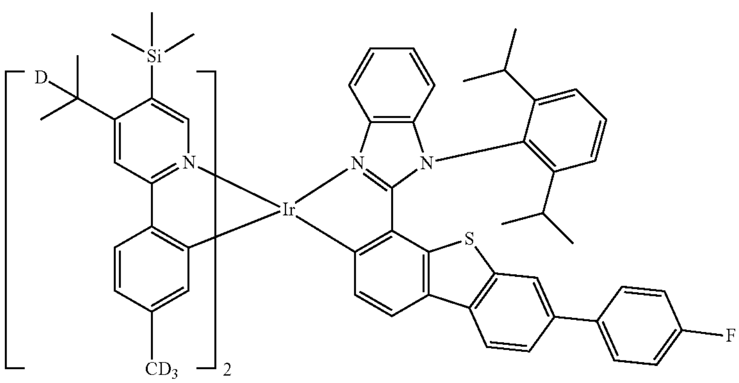

-continued
2468
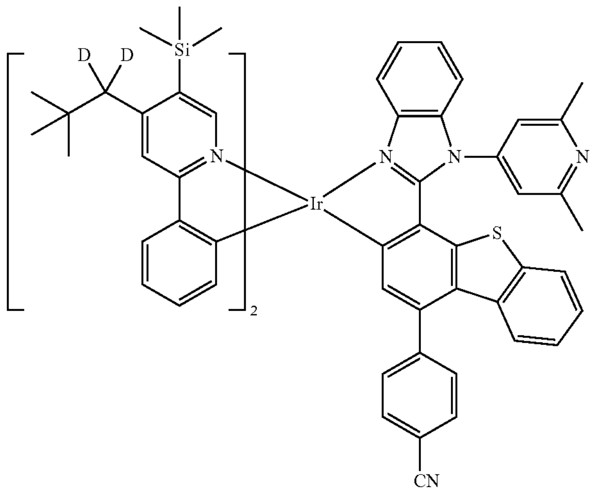
2469
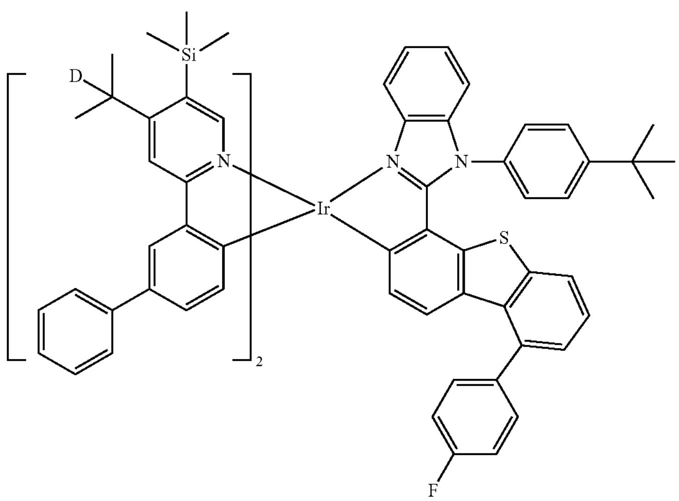
2470
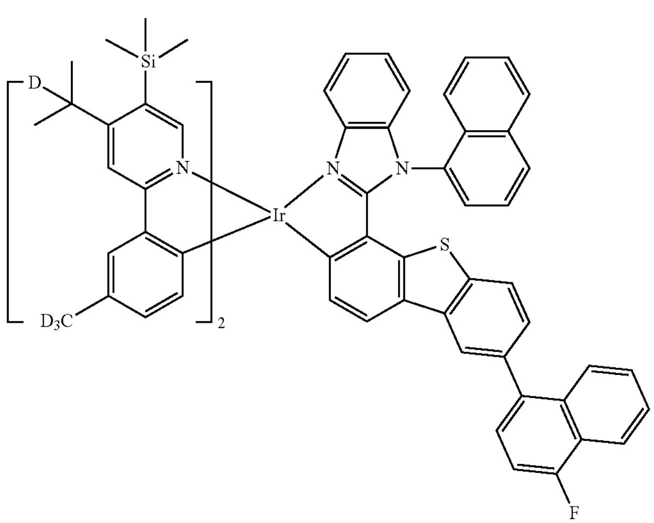

-continued
2471
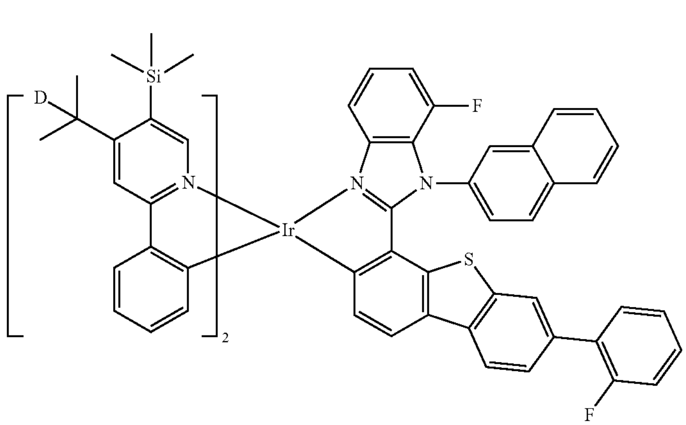
2472
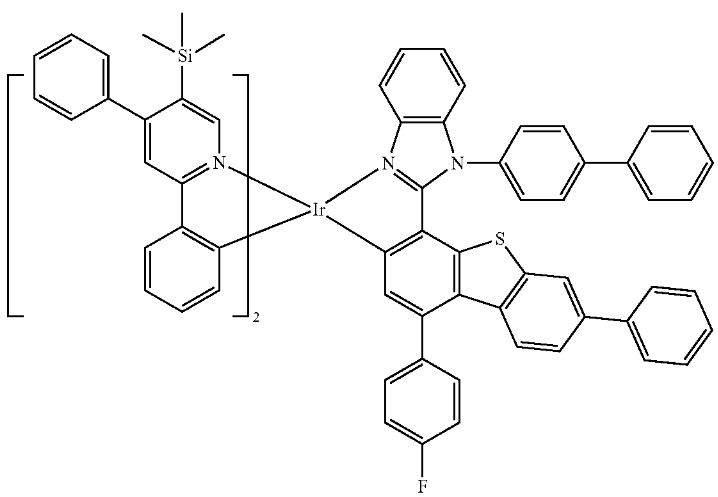
2473
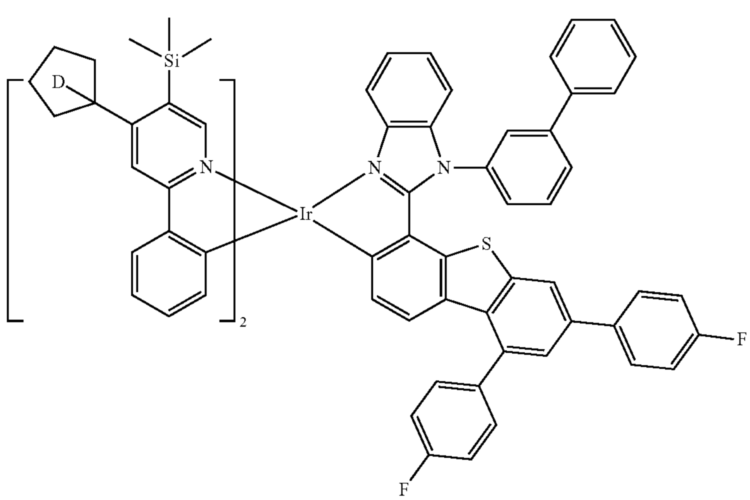

-continued
2474
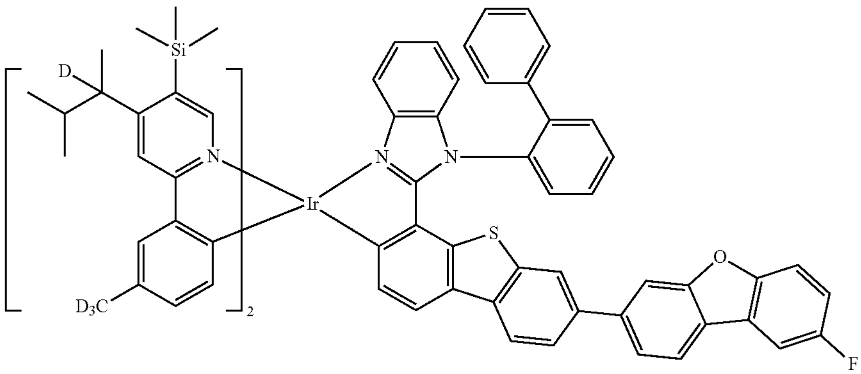
2475
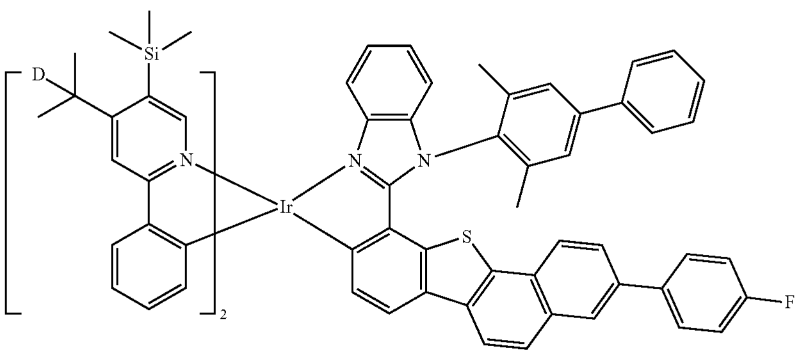
2476
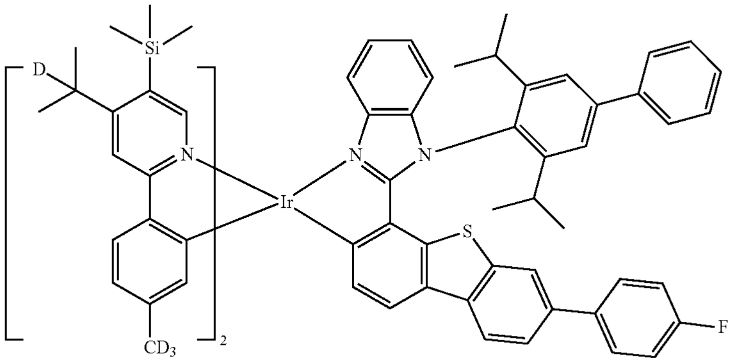
2477
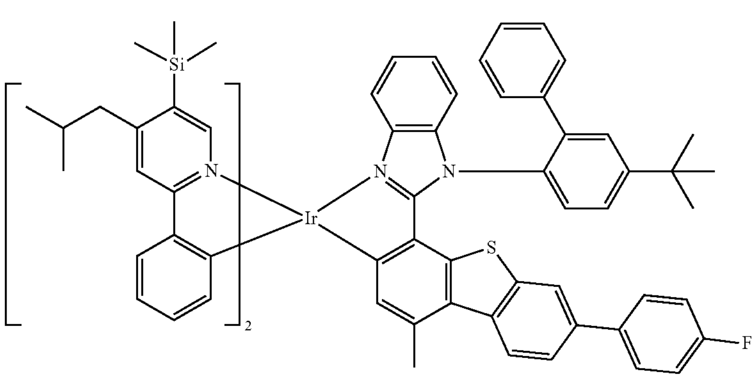

-continued
2478
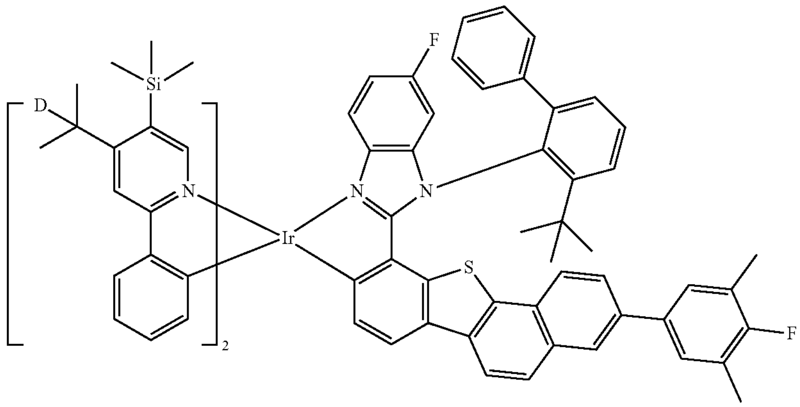
2479
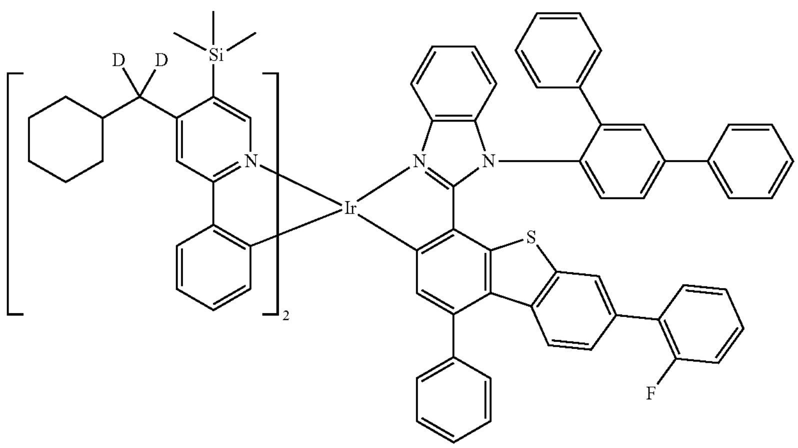
2480
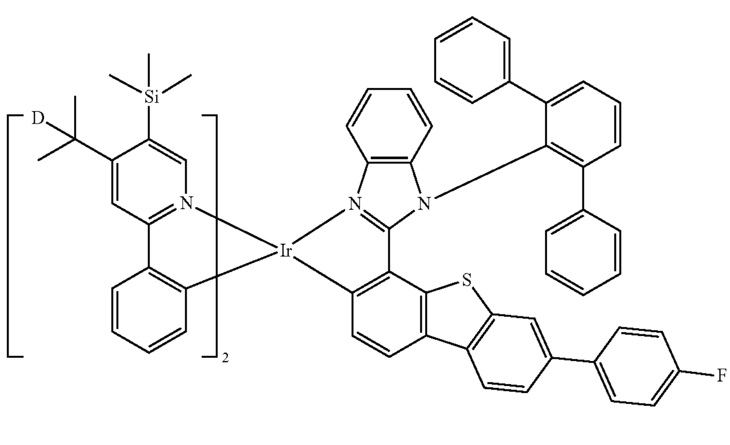

-continued
2481
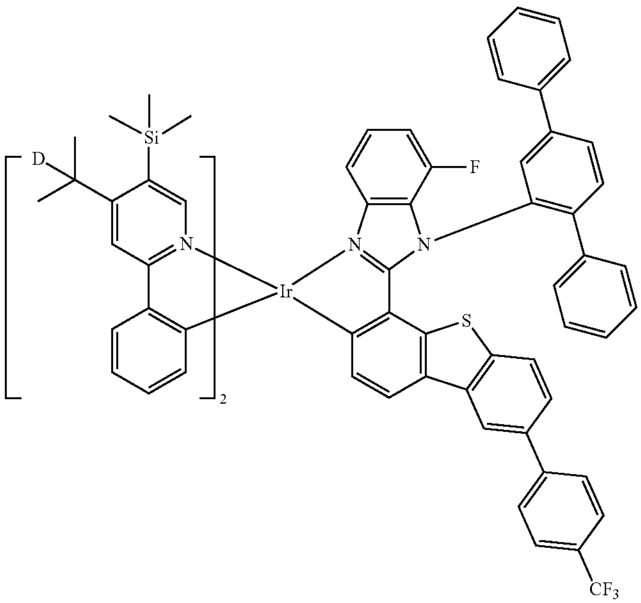
2482
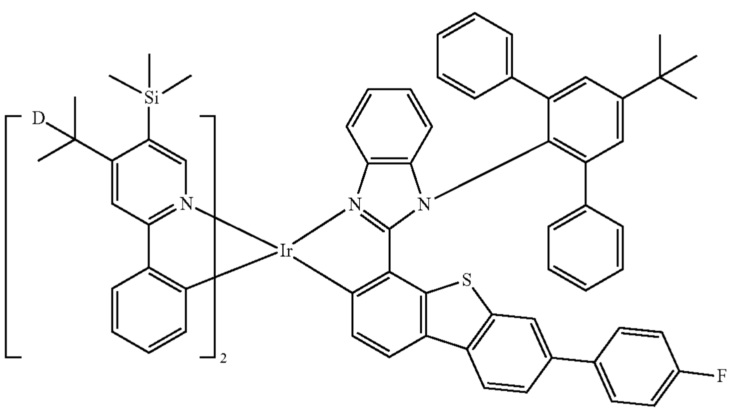
2483
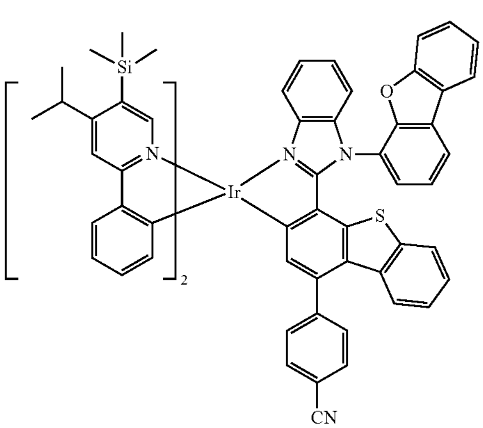
2484
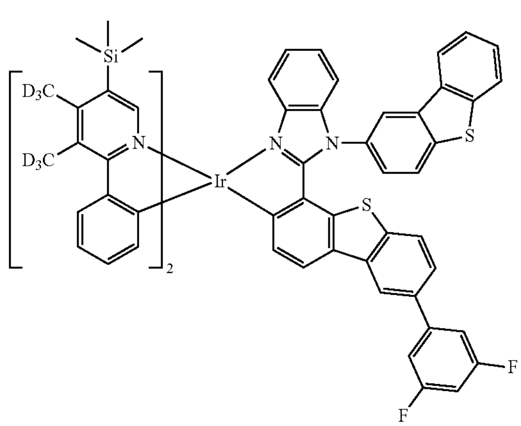

-continued
2485
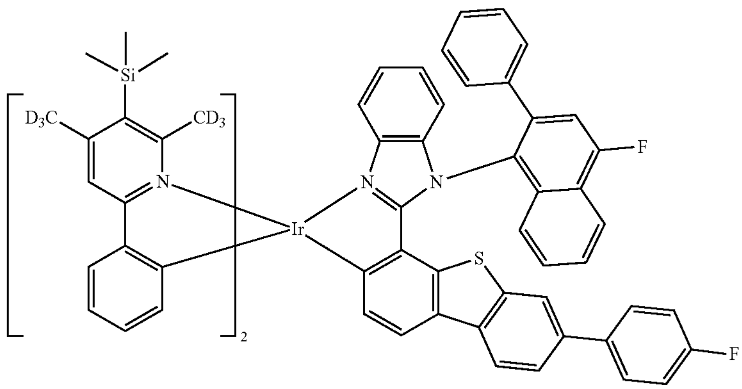
2486
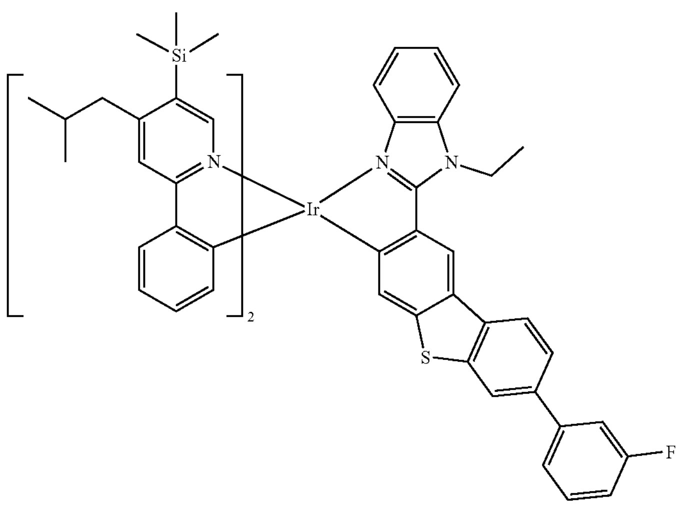
2486
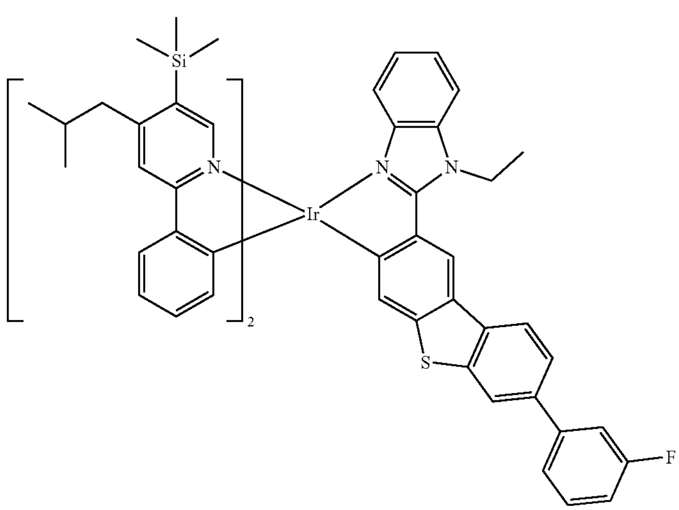

-continued
2487
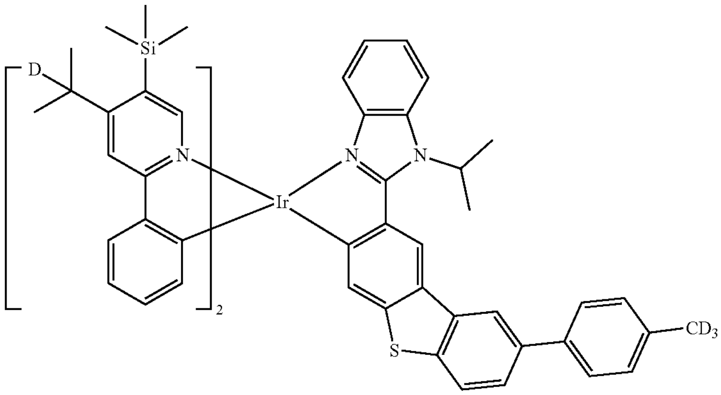
2488
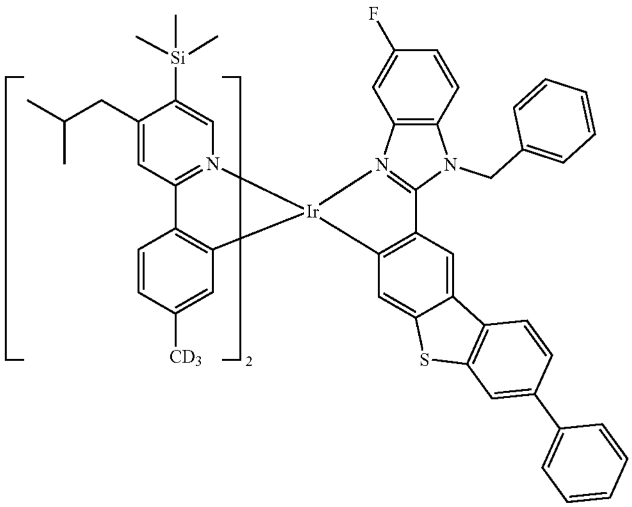
2489
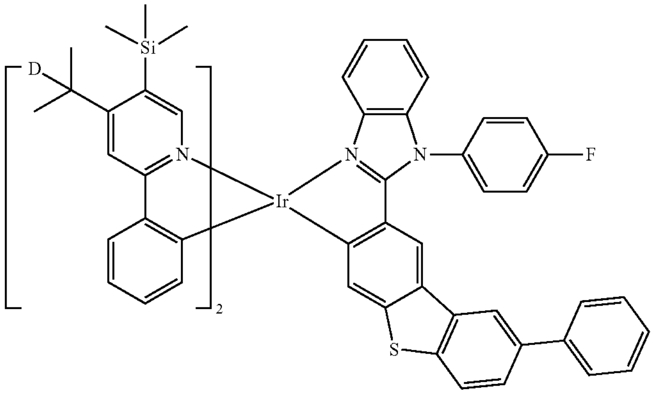

-continued
2490
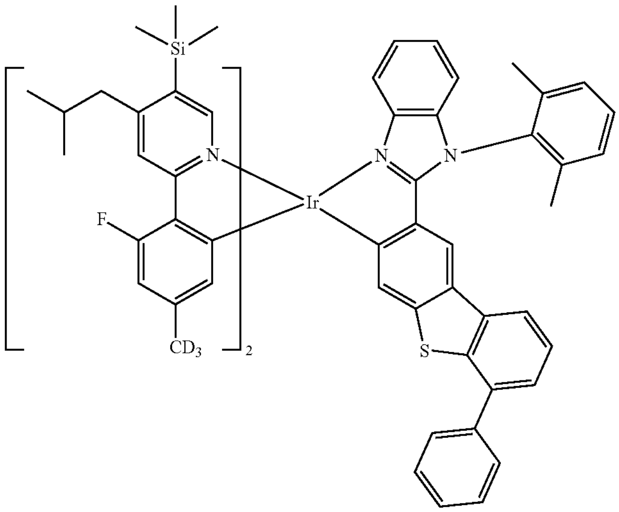
2491
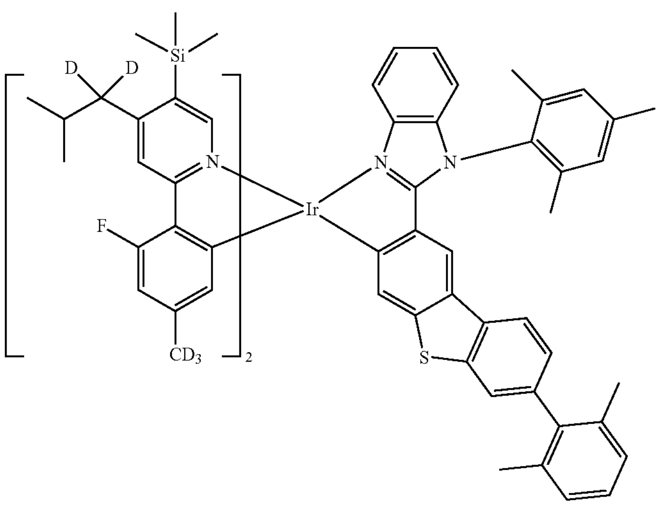
2492
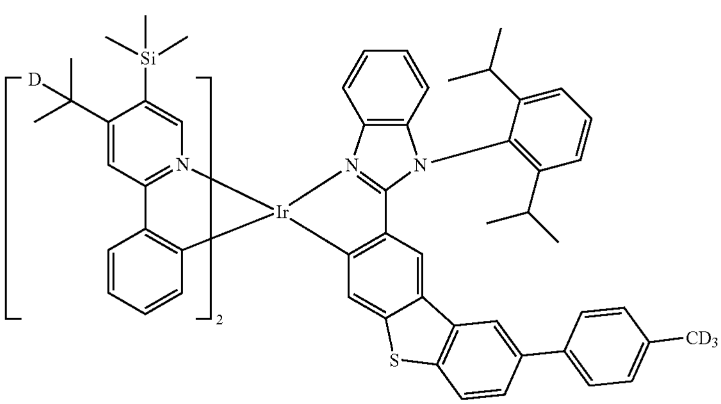

-continued
2493
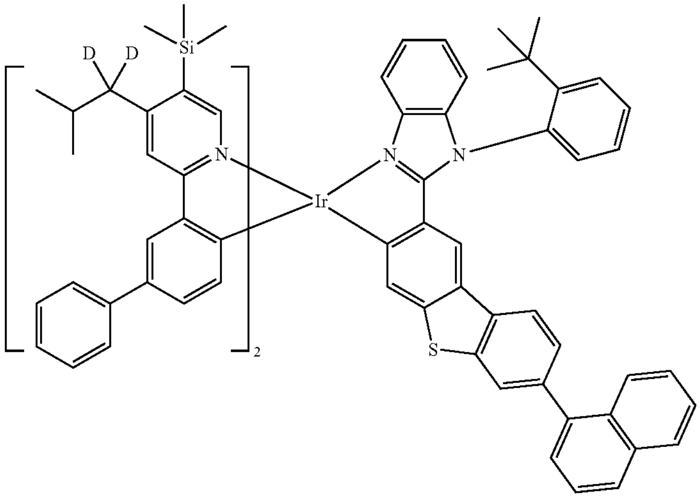
2494
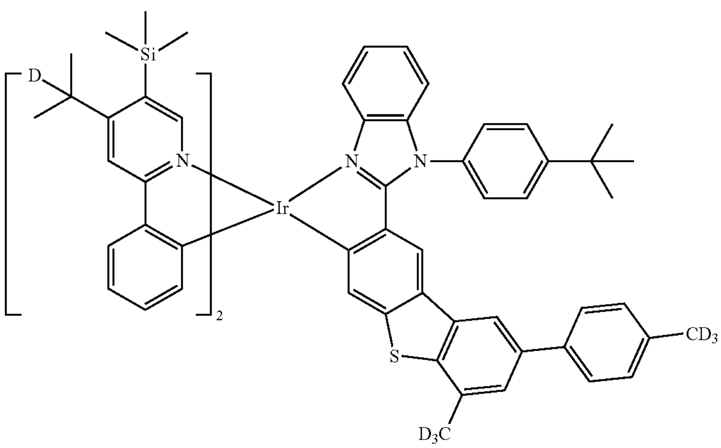
2495
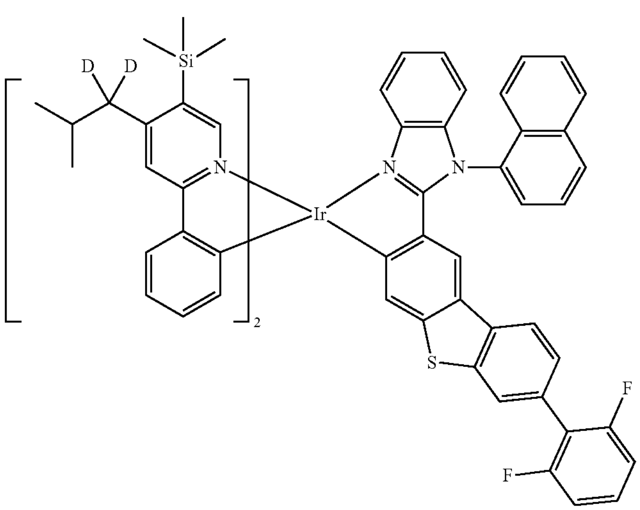

-continued
2496
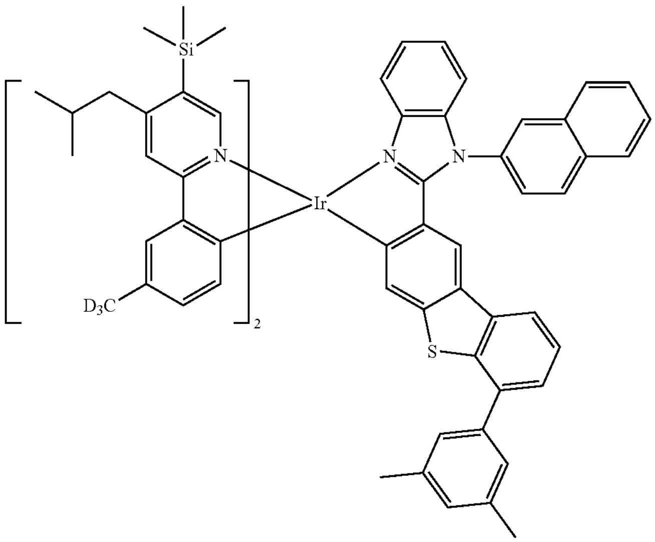
2497
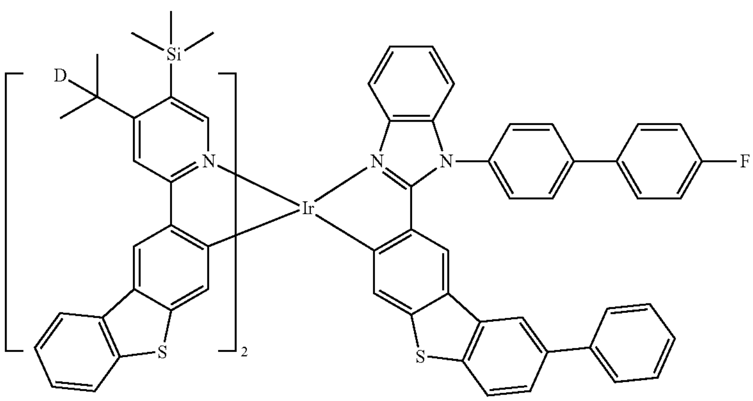
2498
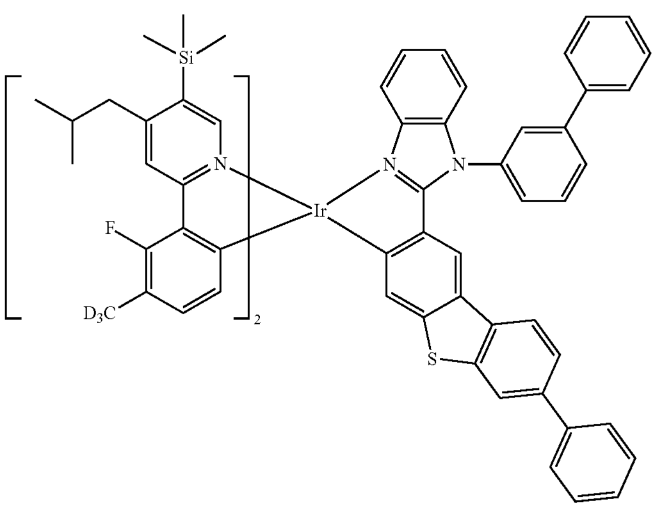

-continued
2499
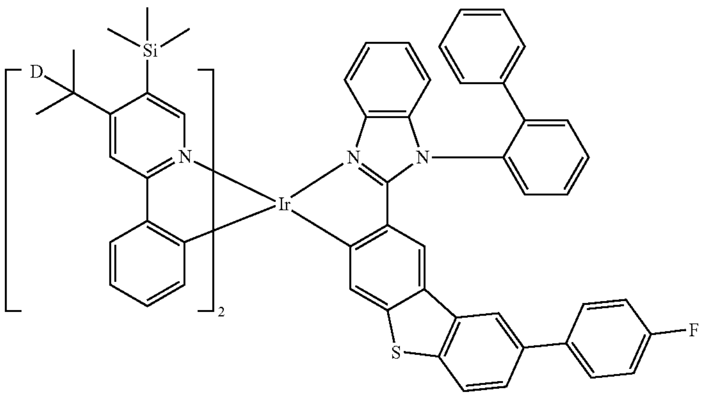
2500
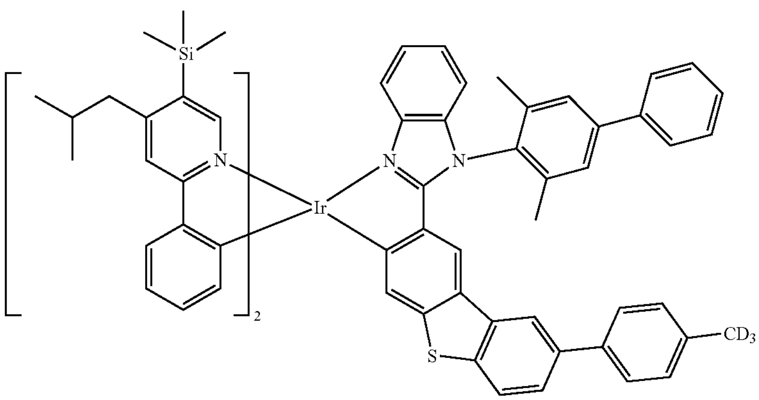
2501
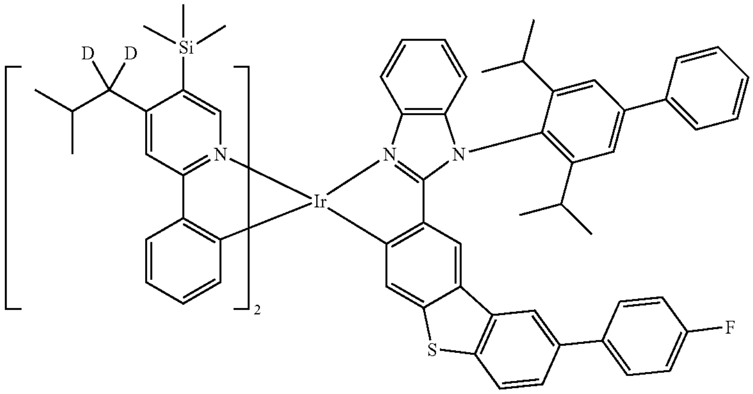

-continued
2502
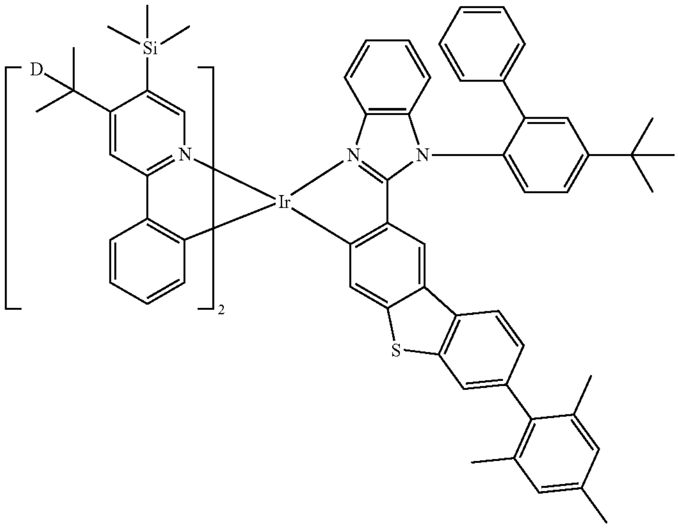
2503
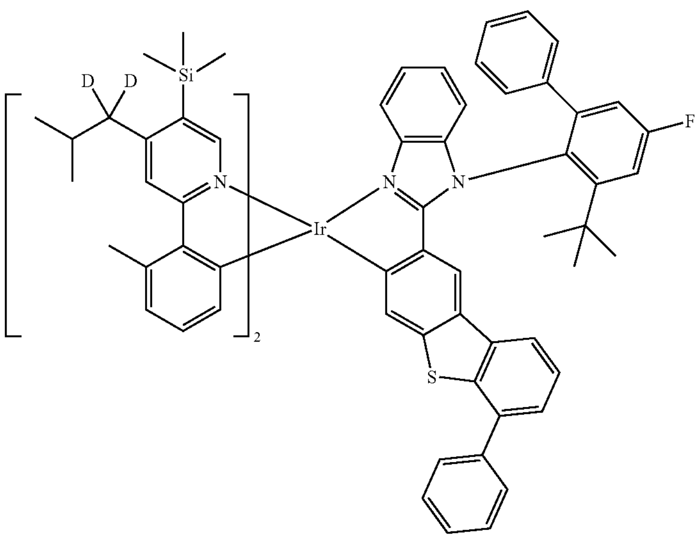
2504
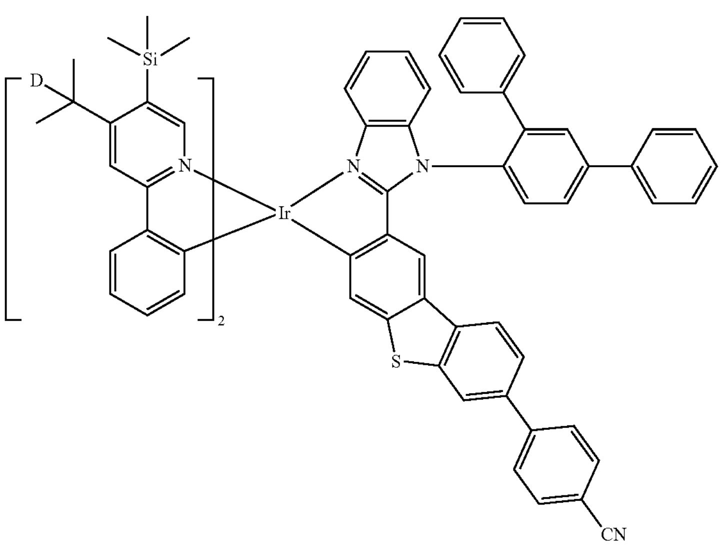

-continued
2505
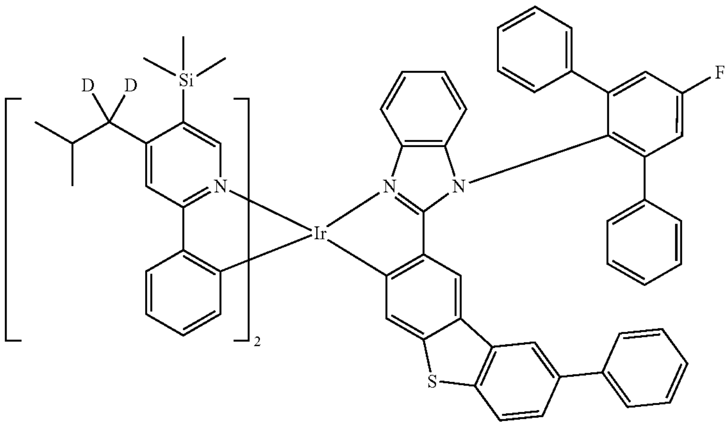
2506
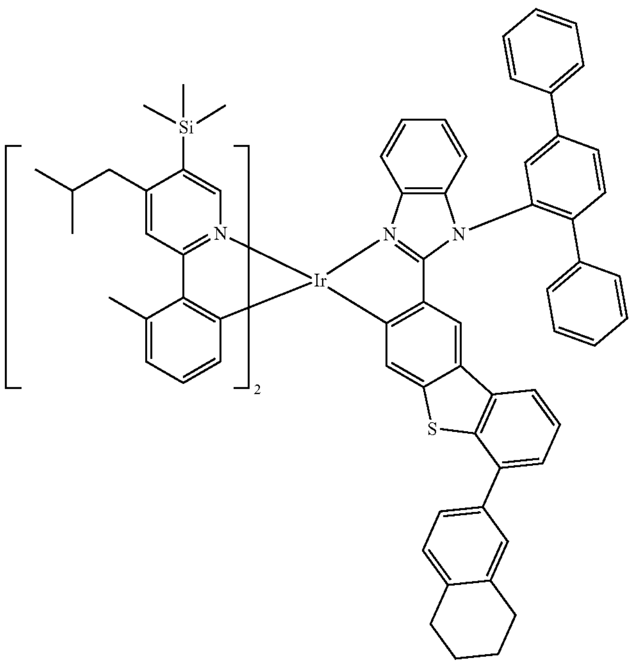
2507
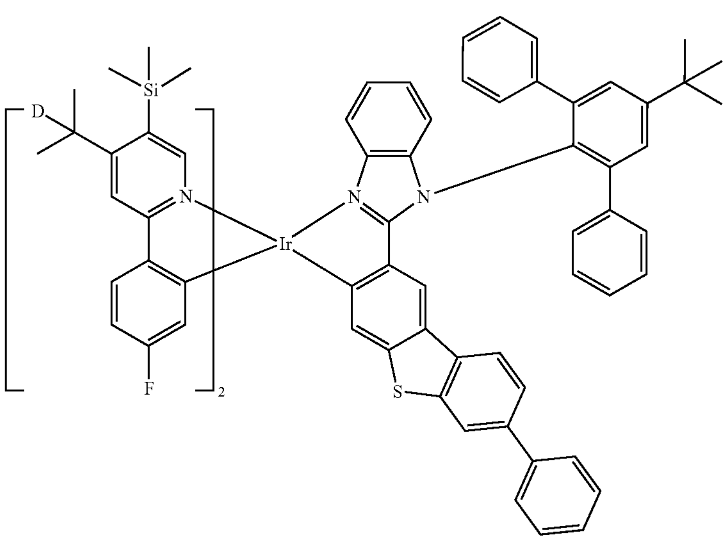

-continued
2508
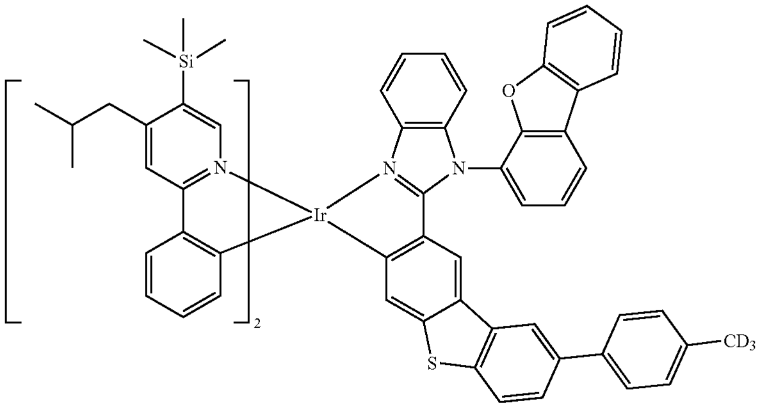
2509
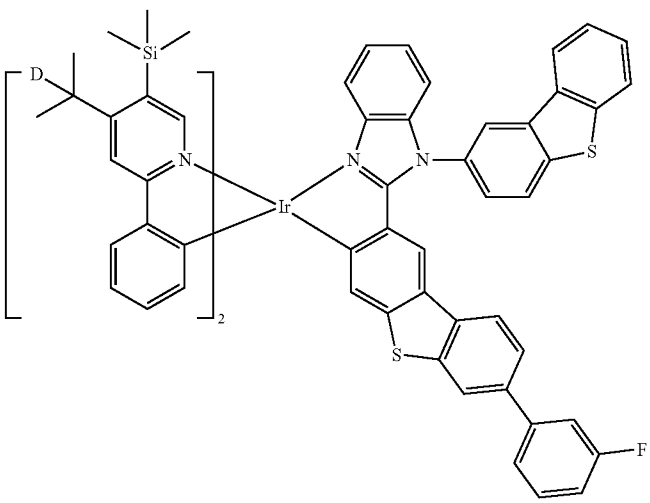
2510
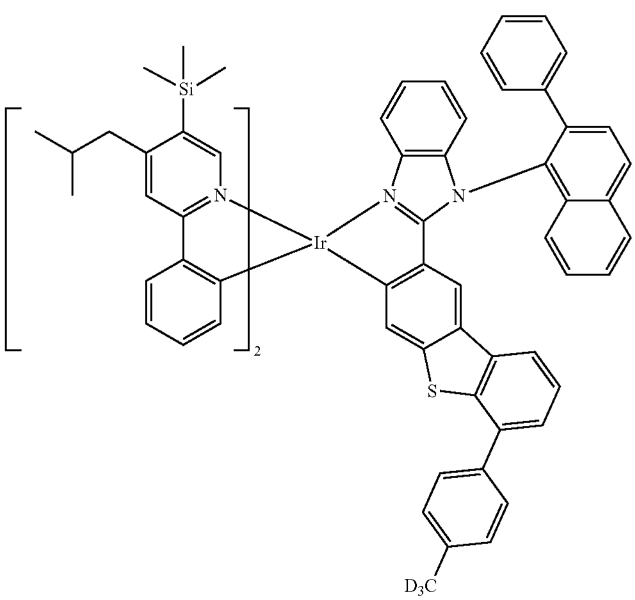

-continued
2511
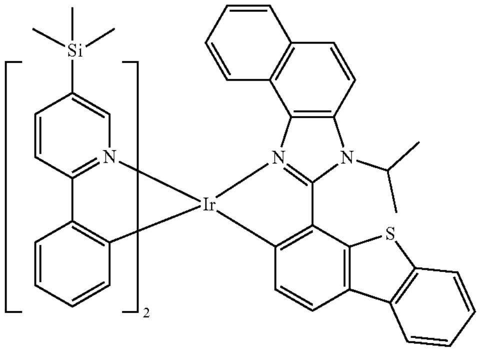
2512
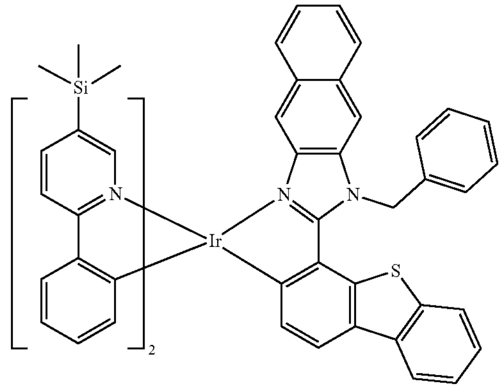
2513
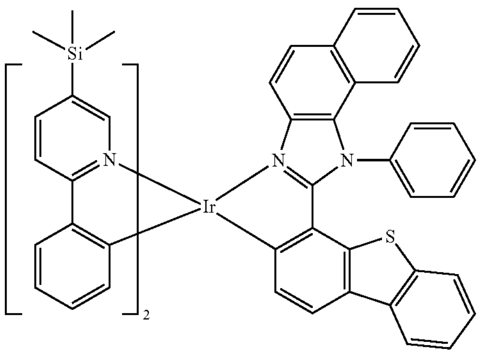
2514
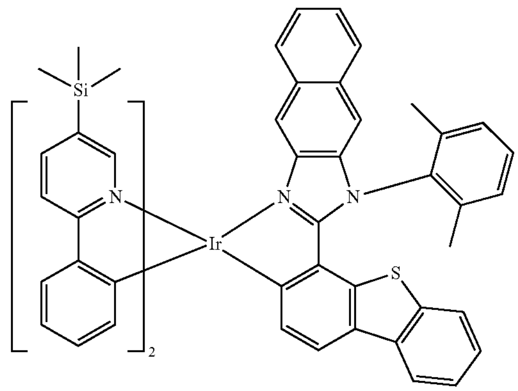
2515
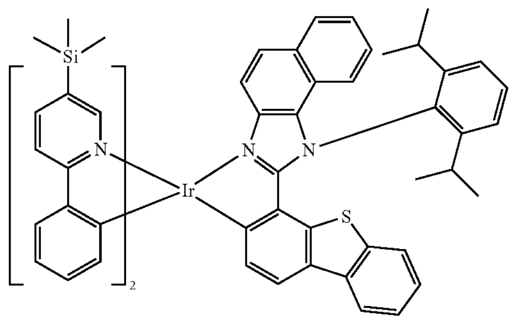
2516
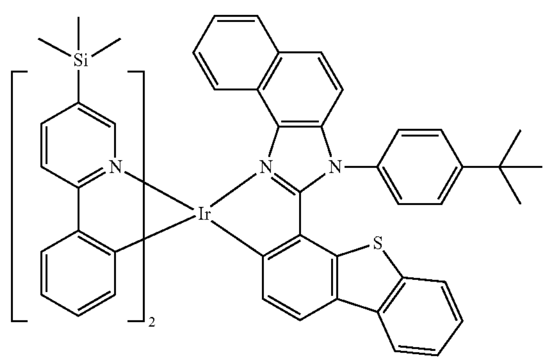
2517
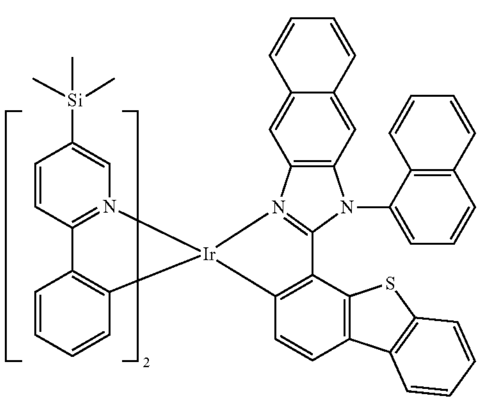
2518
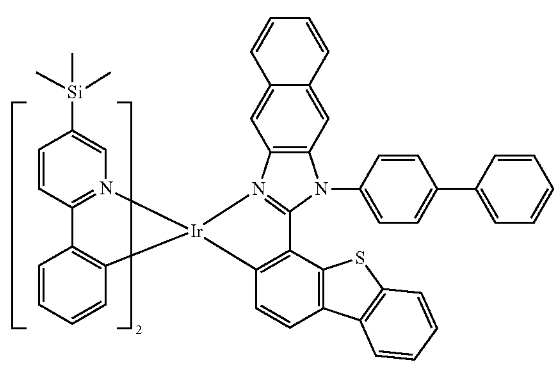

-continued
2519
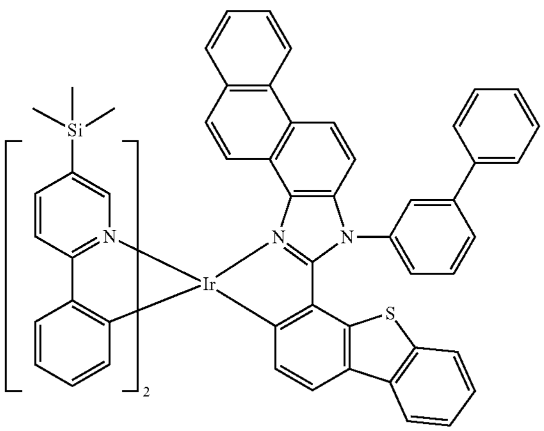
2520
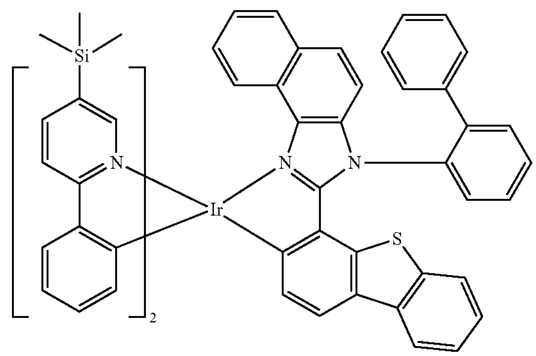
2521
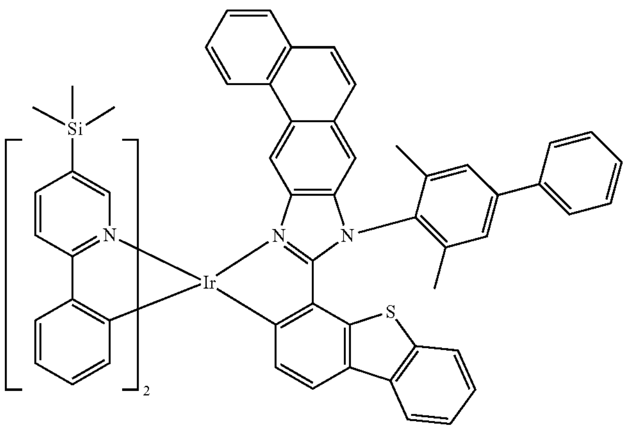
2522
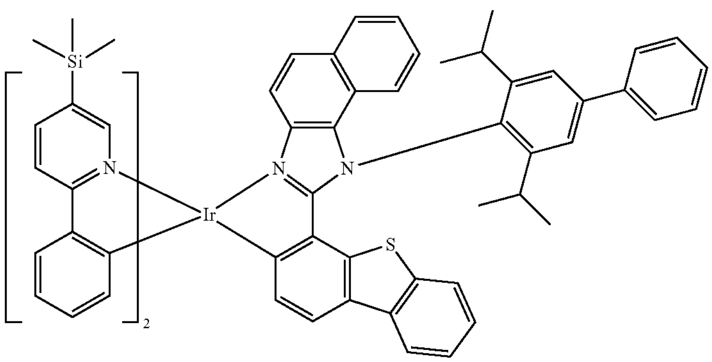
2523
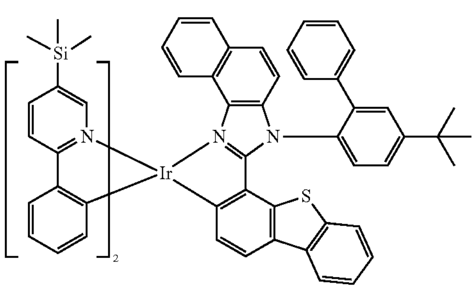
2524
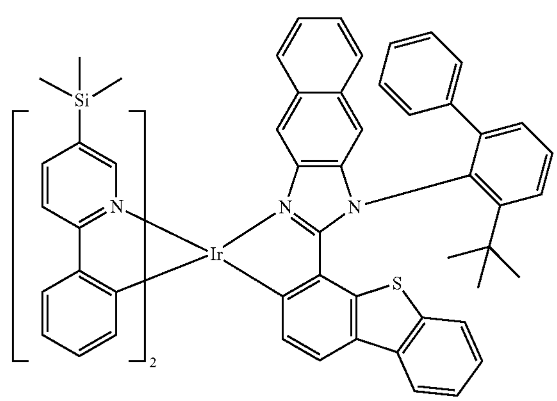

-continued
2525
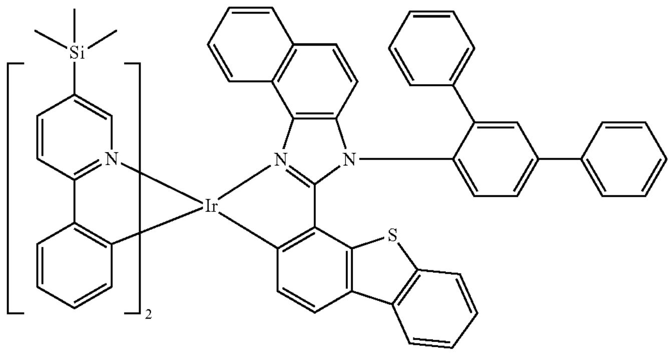
2526
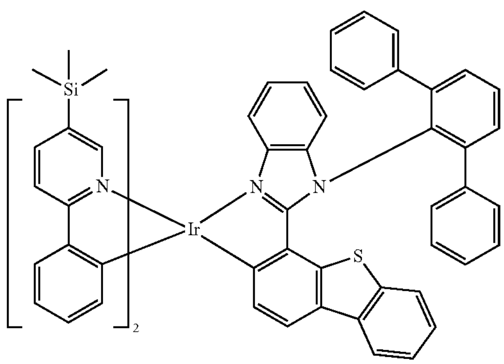
2527
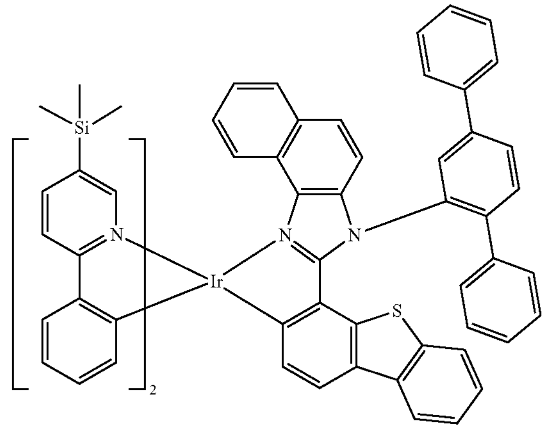
2528
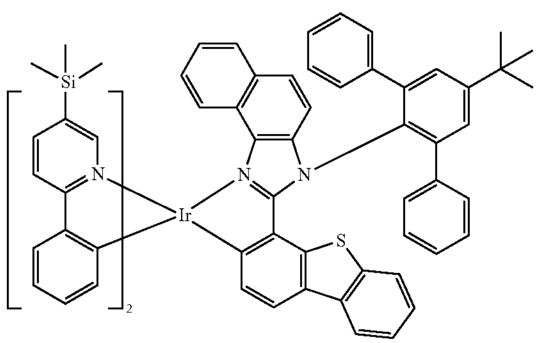
2529
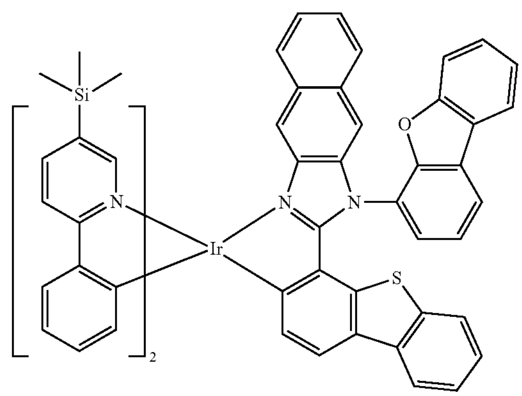
2530
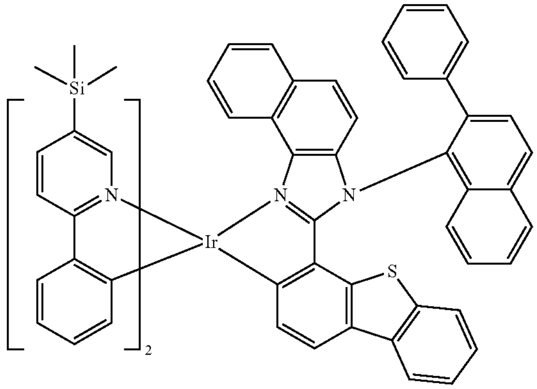

-continued
2531
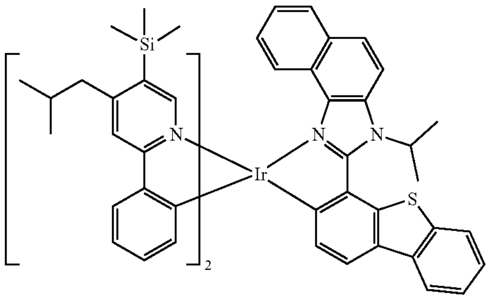
2532
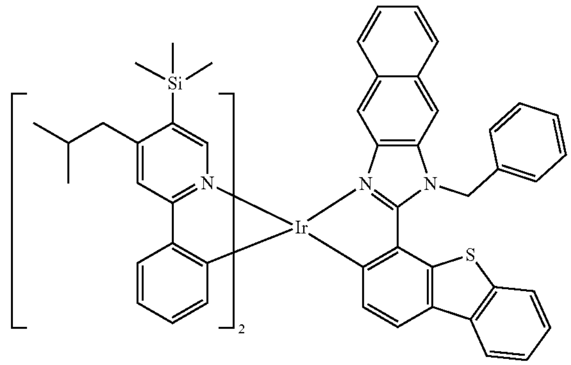
2533
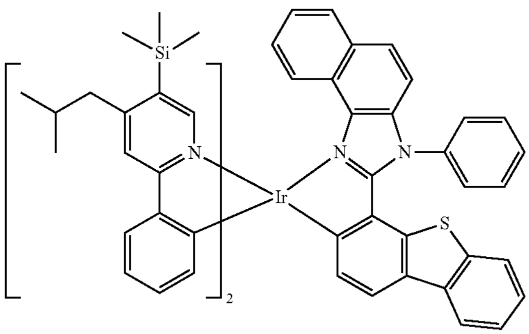
2534
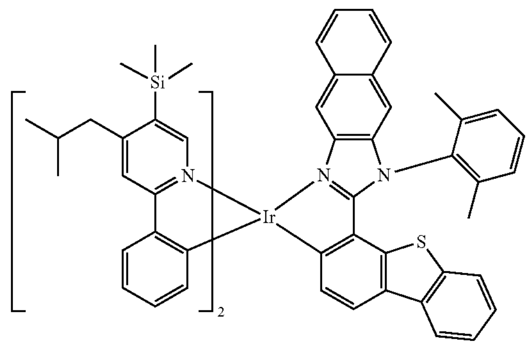
2535
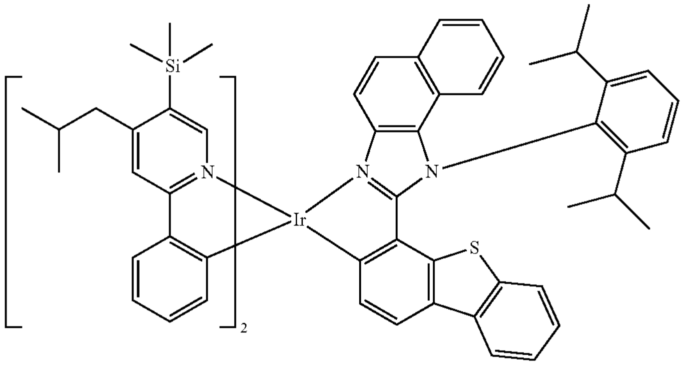
2536
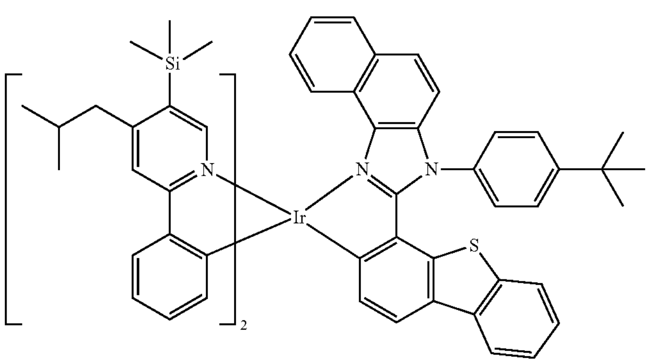

-continued
2537
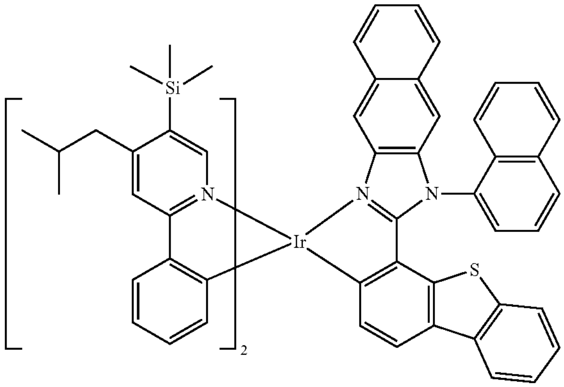
2538
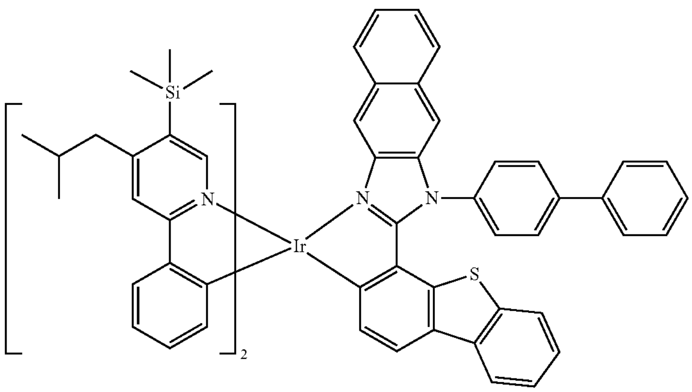
2539
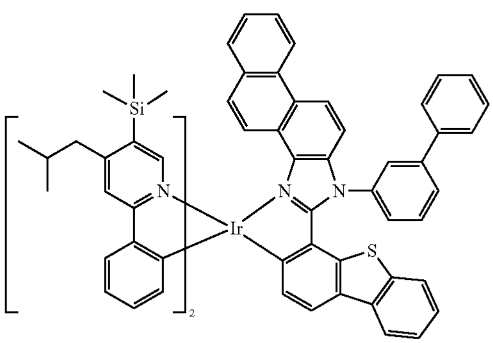
2540
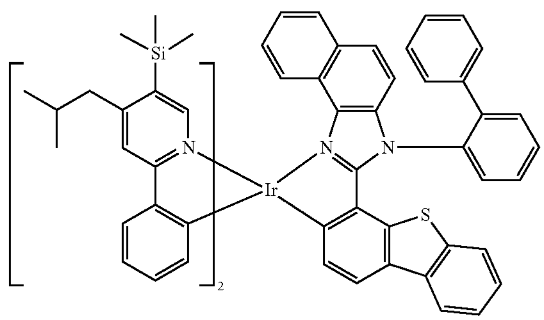
2541
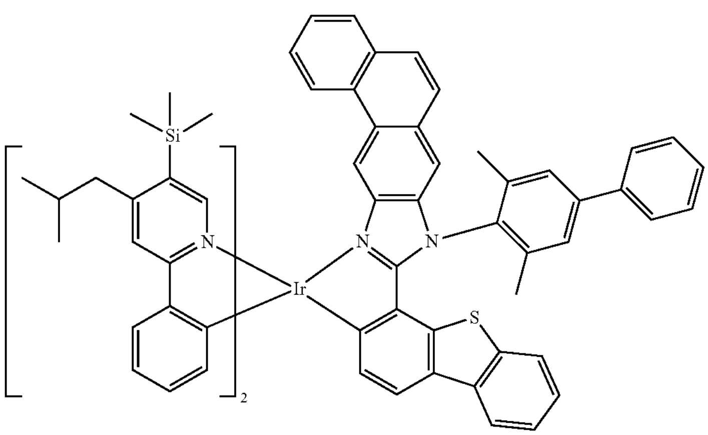

-continued
2542
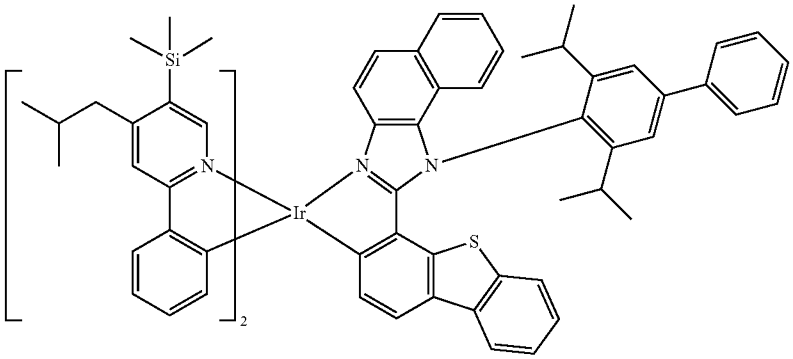
2543
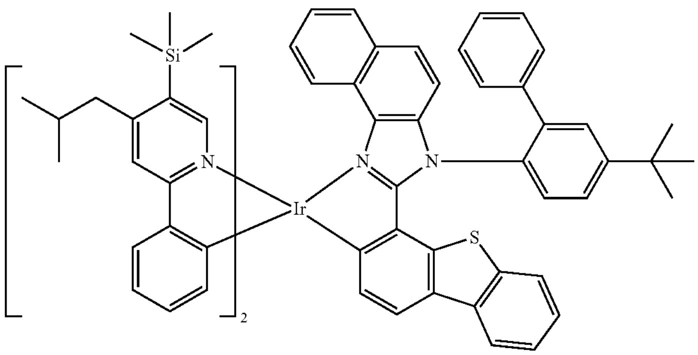
2544
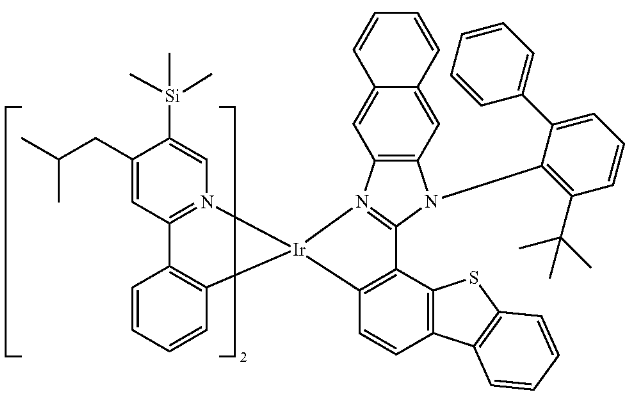
2545
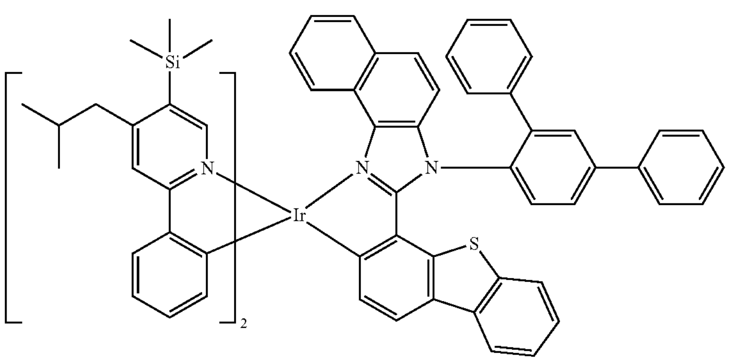

-continued
2546
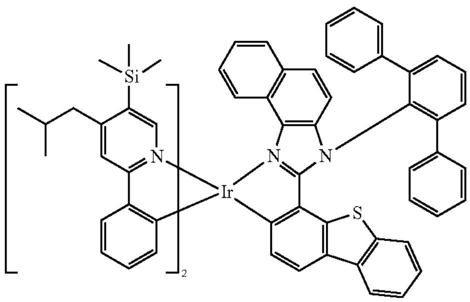
2547
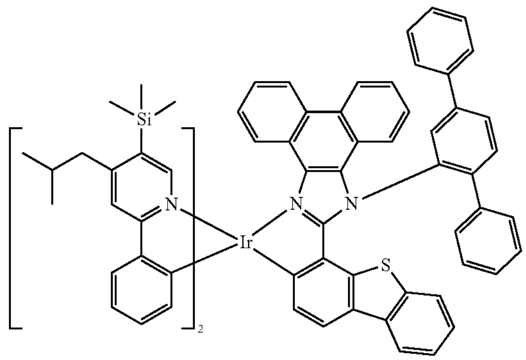
2548
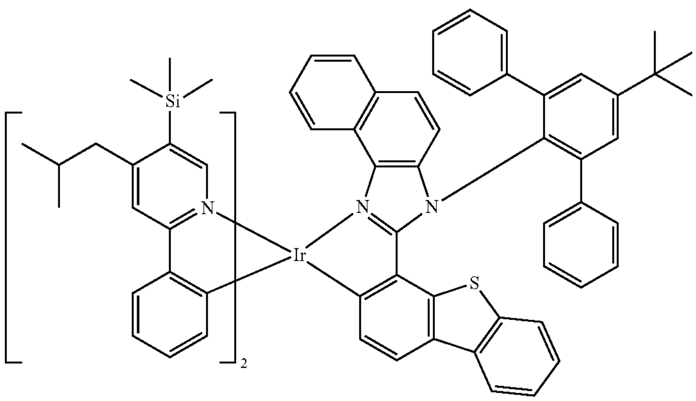
2549
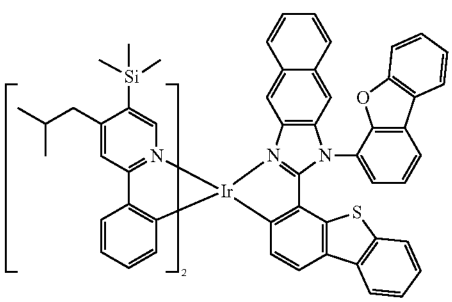
2550
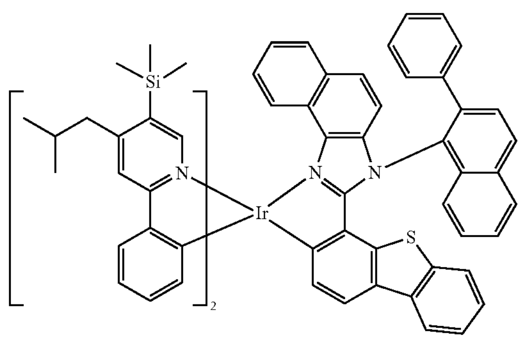
2551
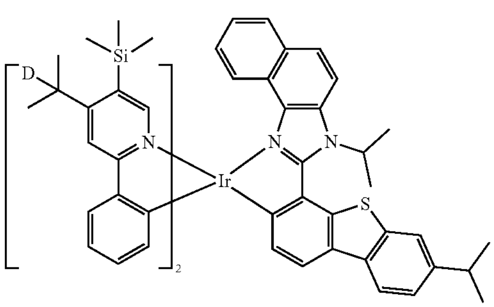
2552
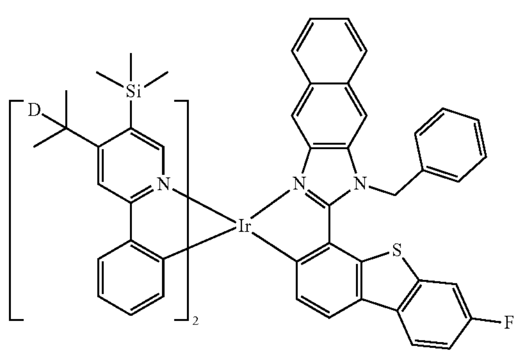

-continued
2553
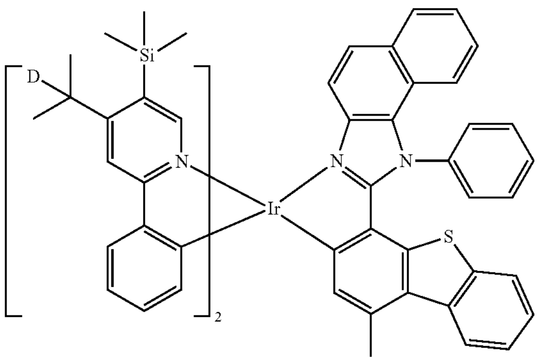
2554
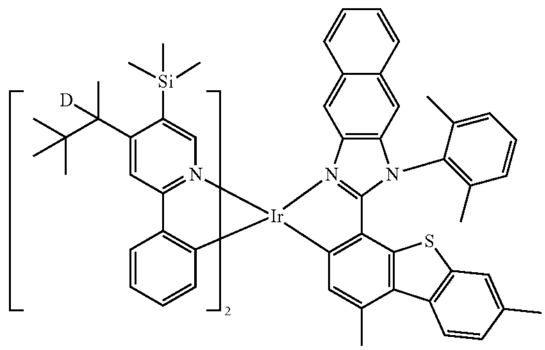
2555
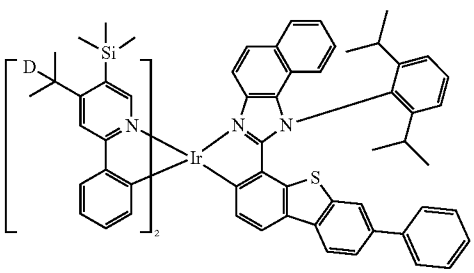
2556
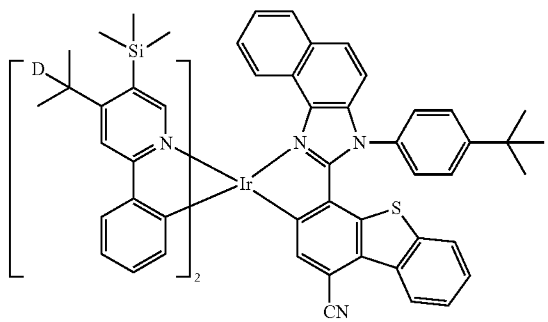
2557
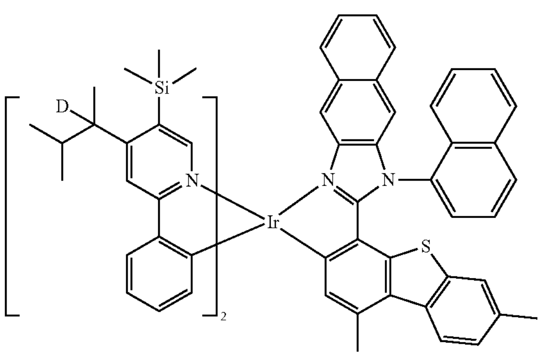
2558
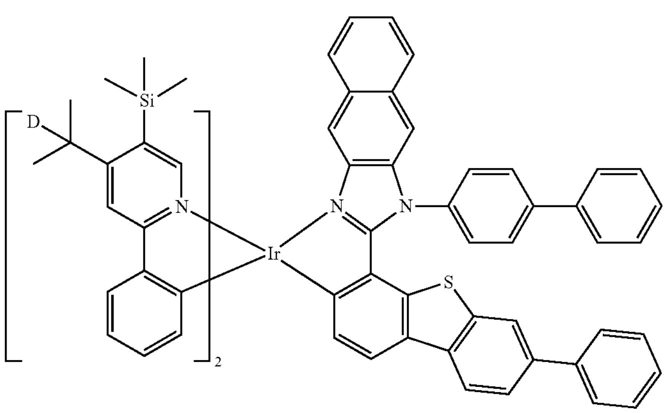

-continued
2559
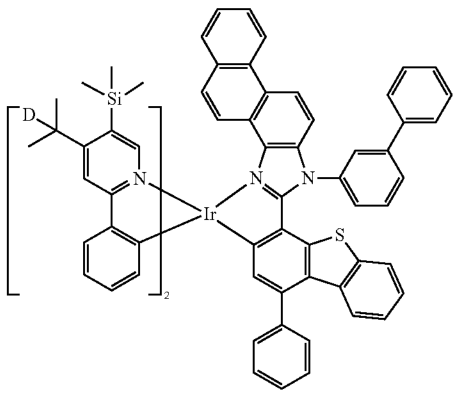
2560
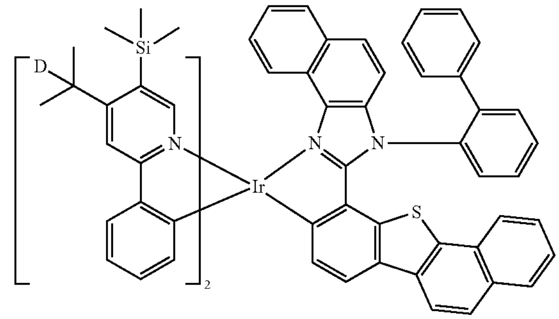
2561
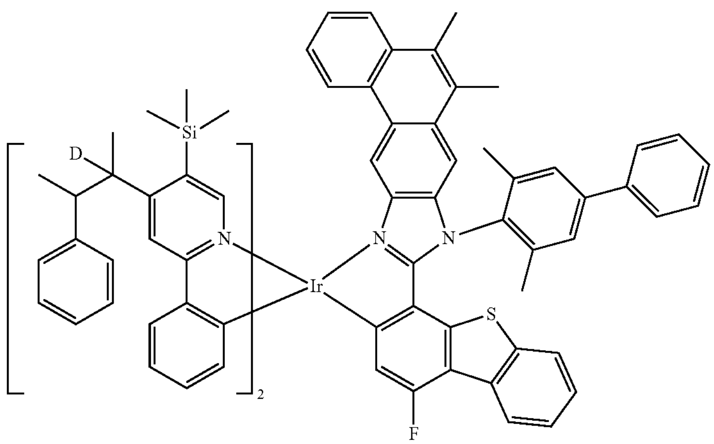
2562
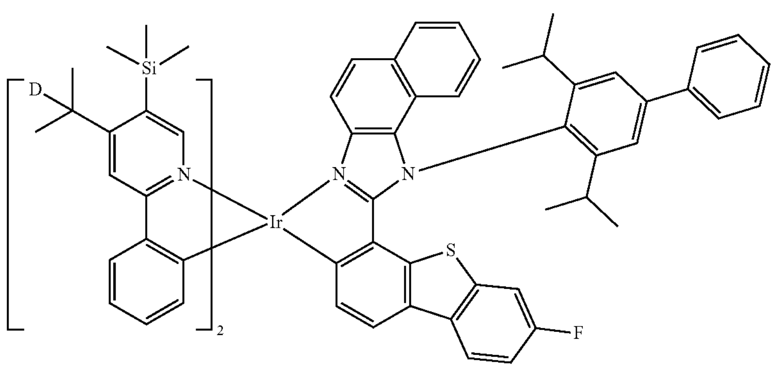
2563
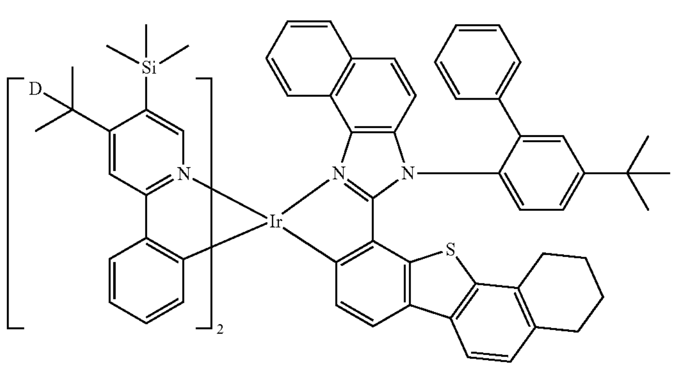

-continued
2564
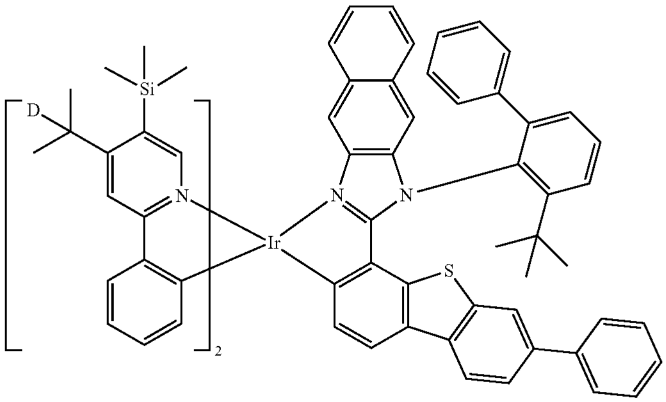
2565
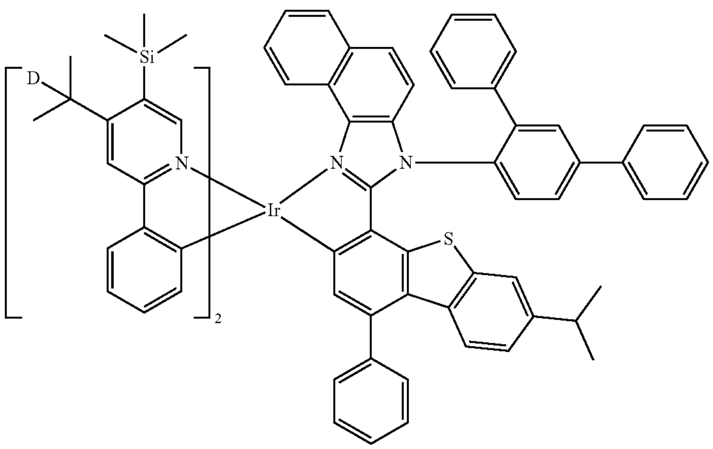
2566
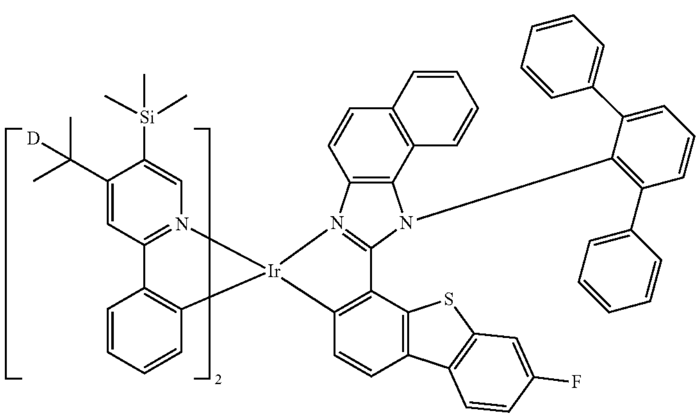

-continued
2567
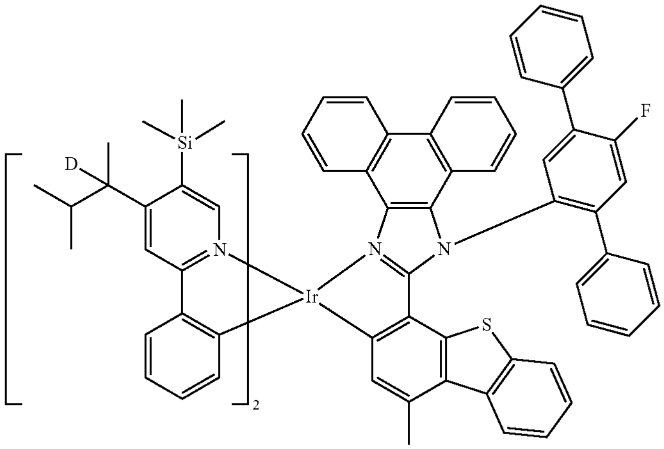
2568
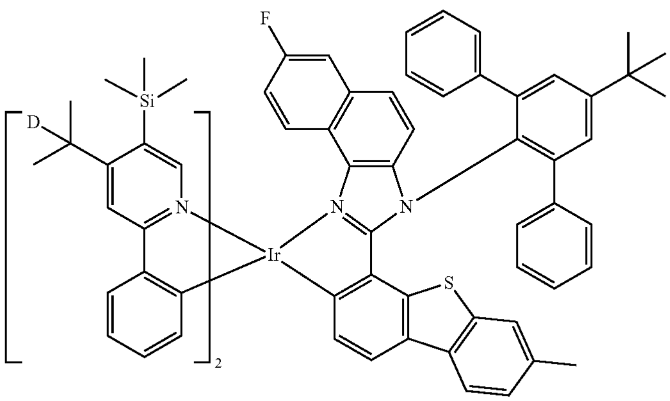
2569
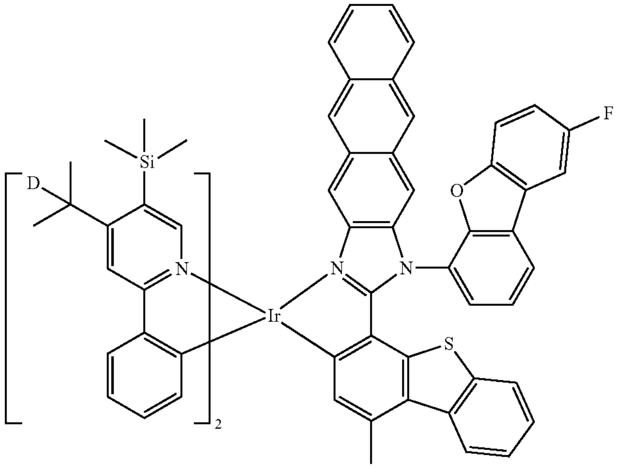

-continued
2570
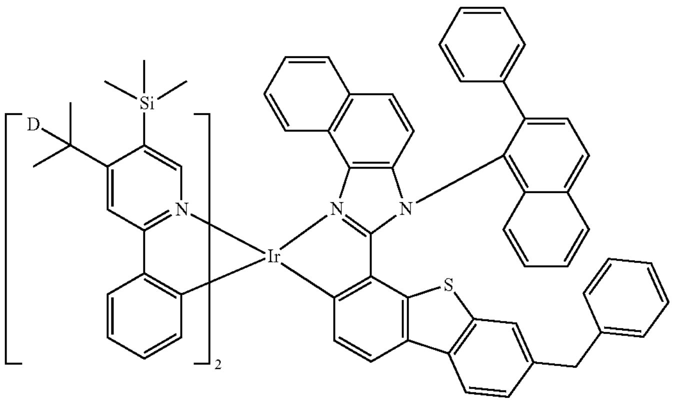
2571
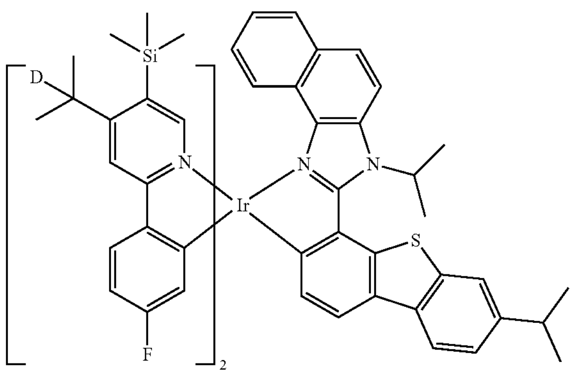
2572
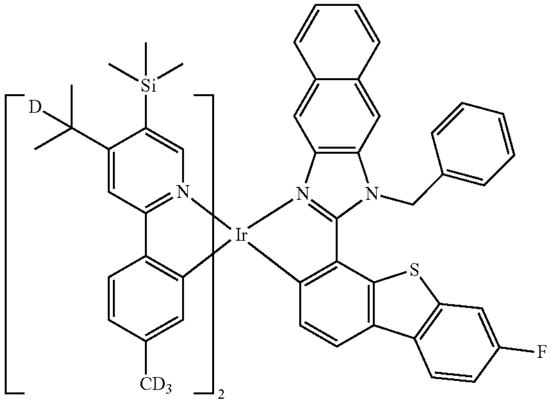
-continued
2573
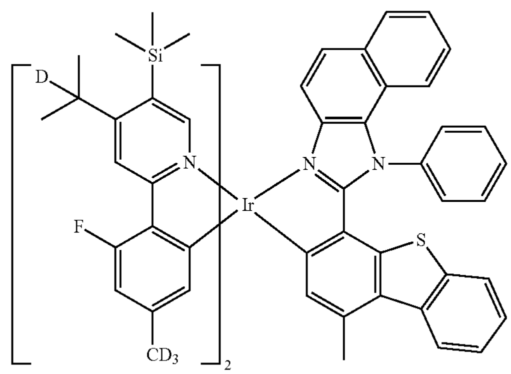
2574
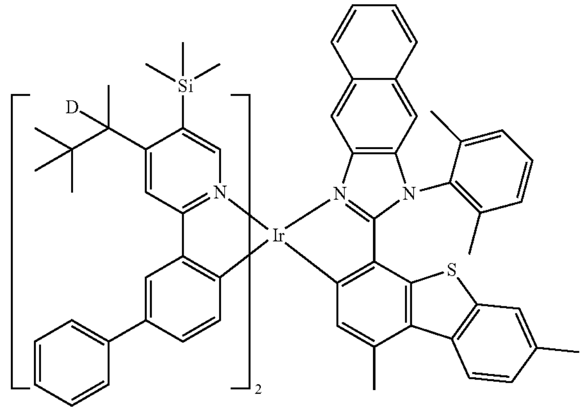

-continued
2575
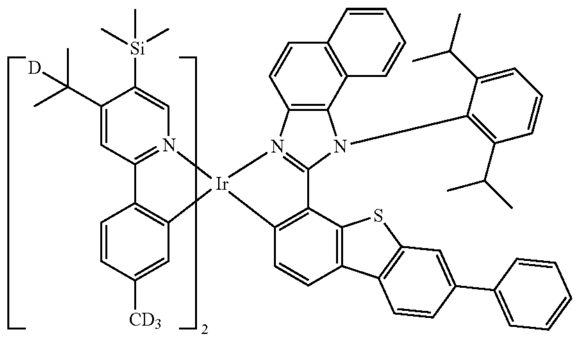
2576
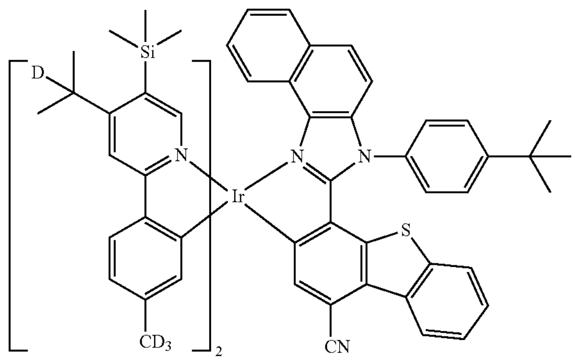
2577
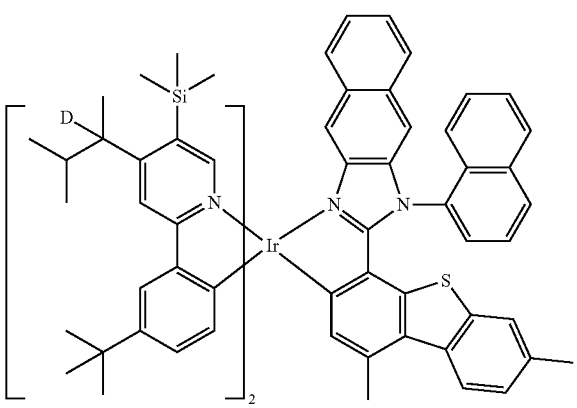
2578
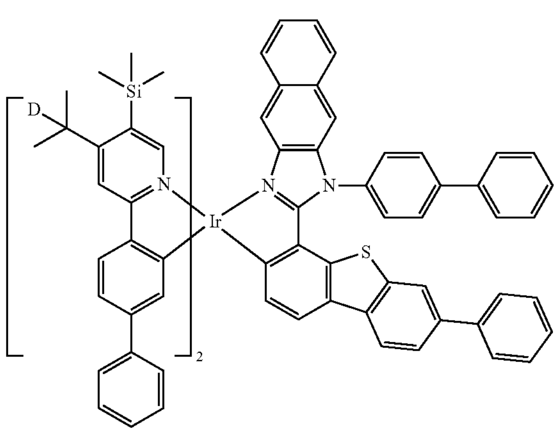
-continued
2579
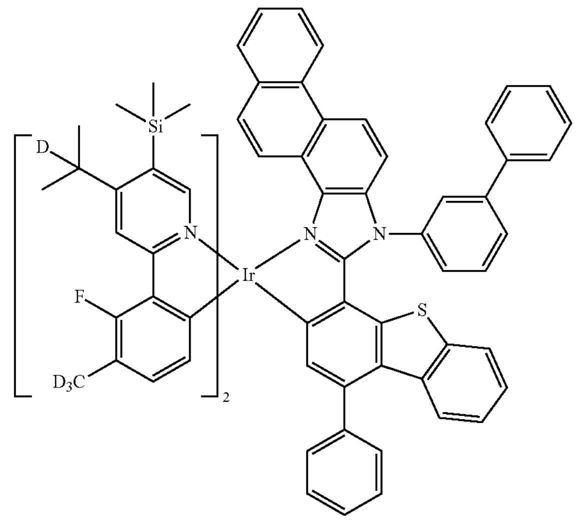
2580
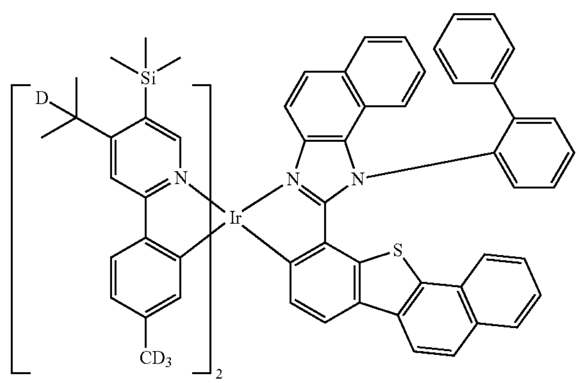
2581
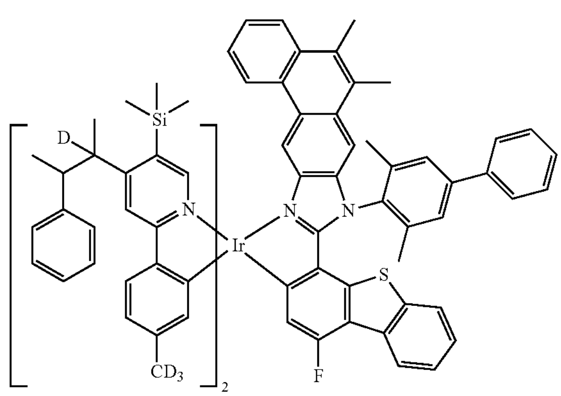
2582
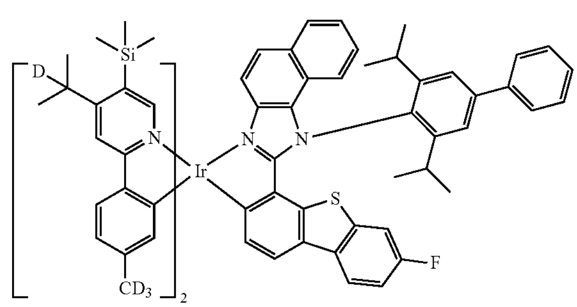

2583
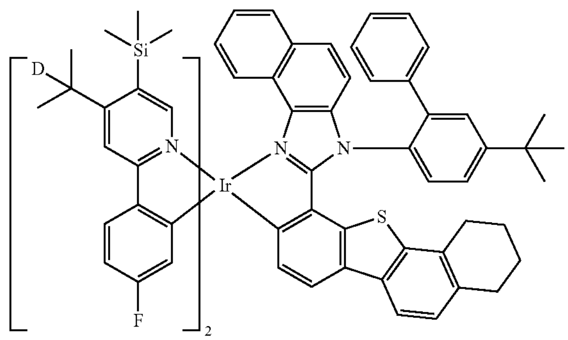
2584
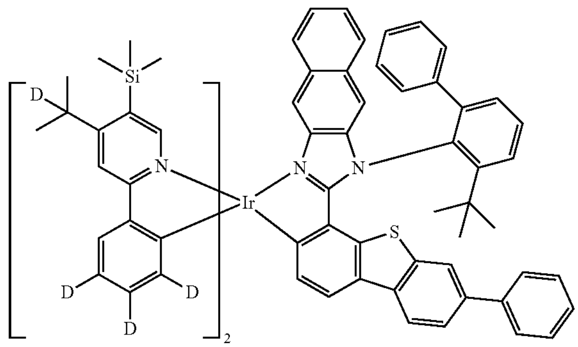
2585
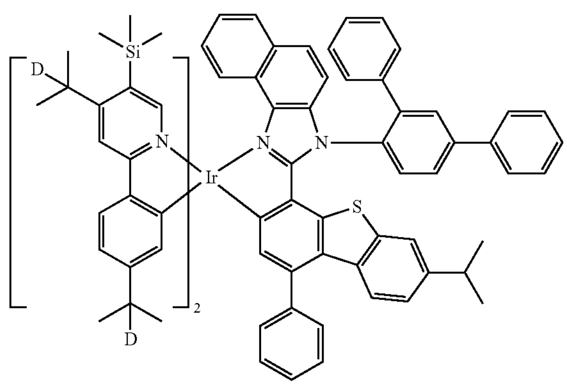
2586
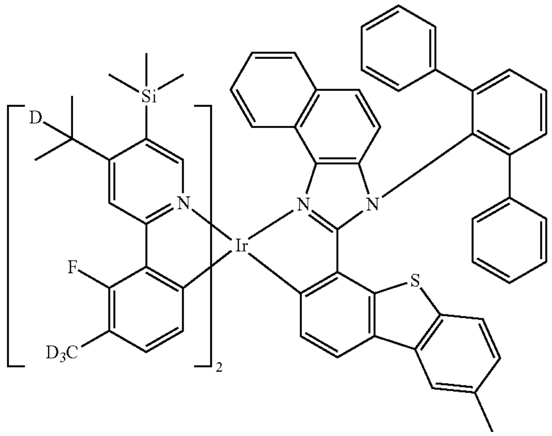
2587
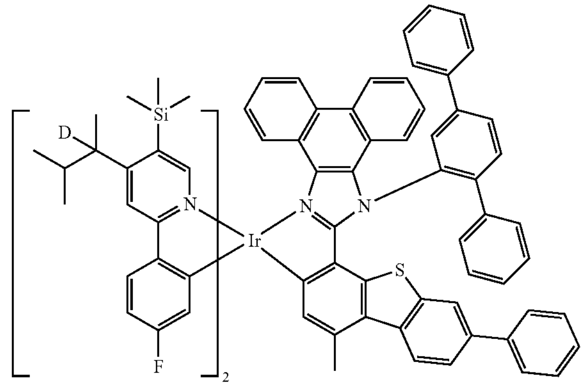
2588
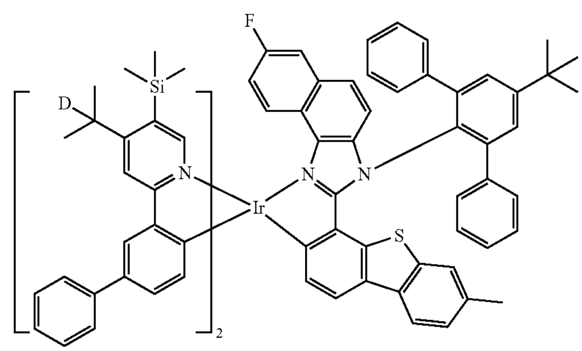
2589
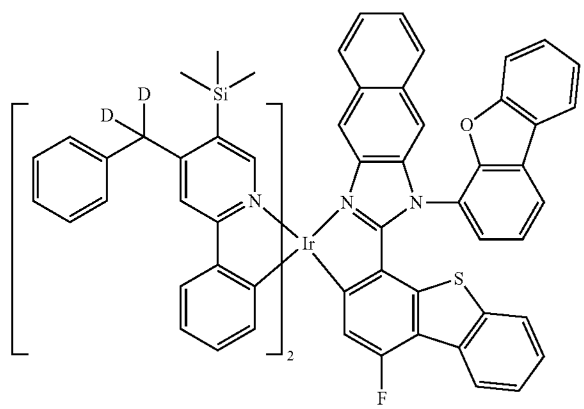
2590
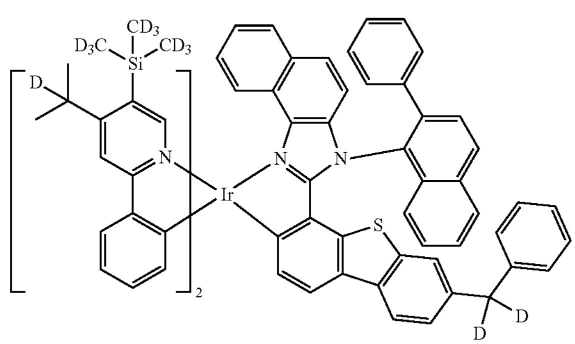

-continued
2591
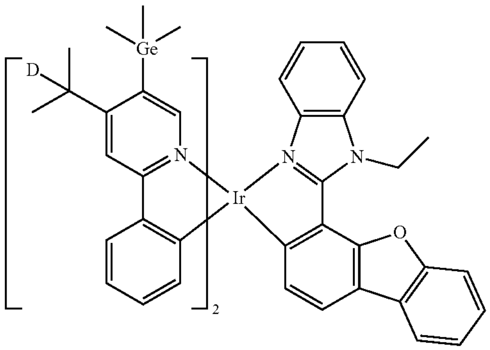
2592
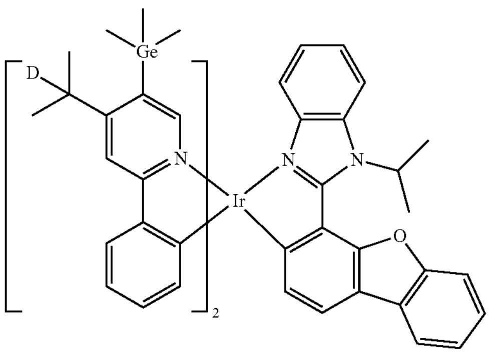
2593
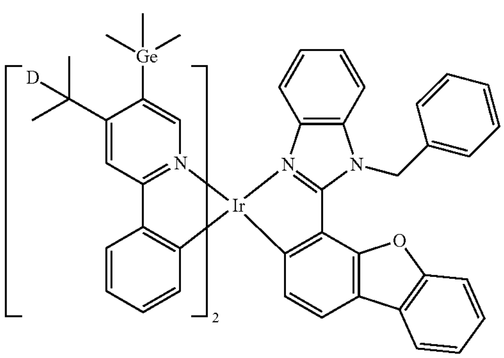
2594
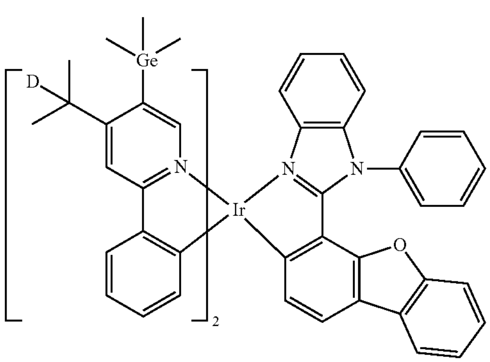
-continued
2595
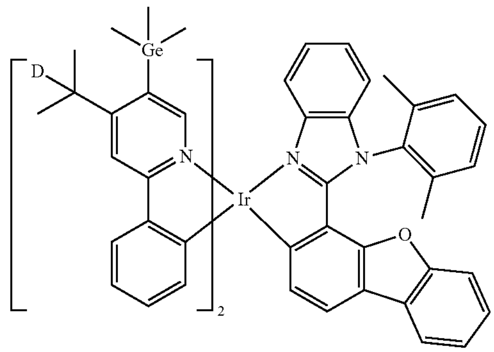
2596
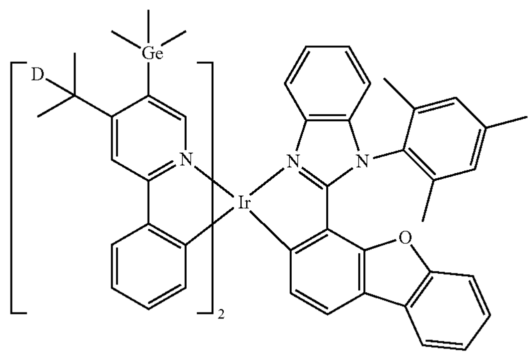
2597
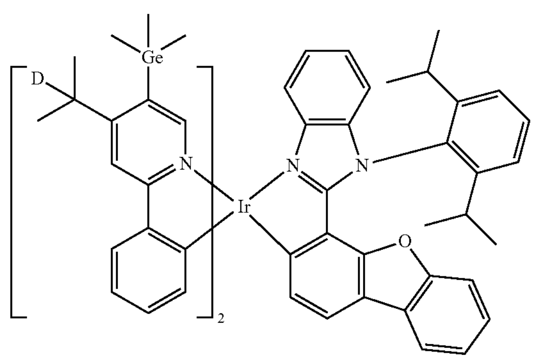
2598
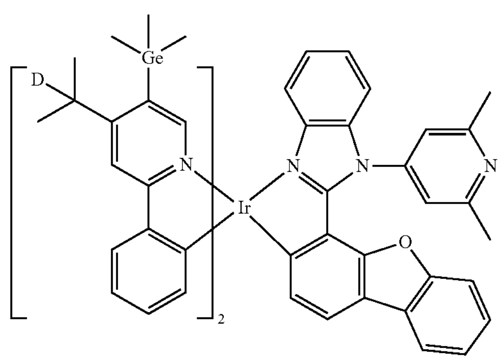

2599
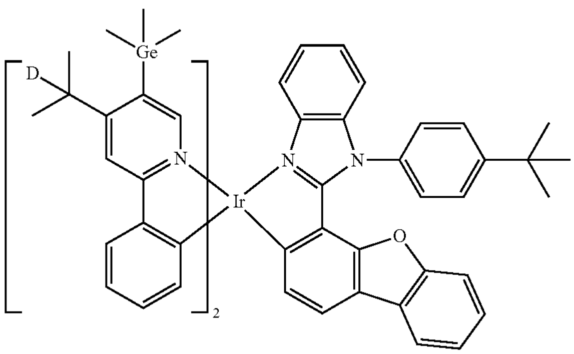
2600
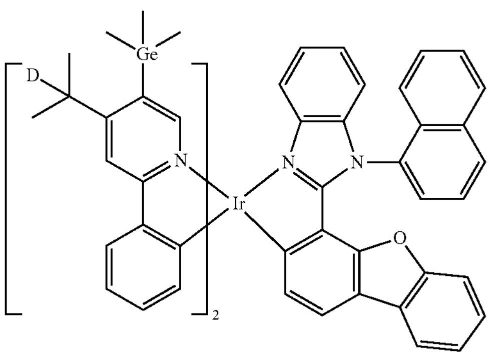
2601
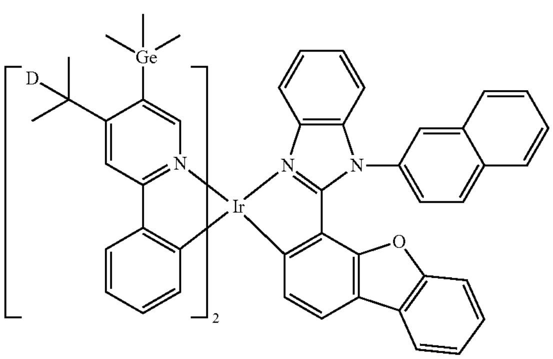
2602
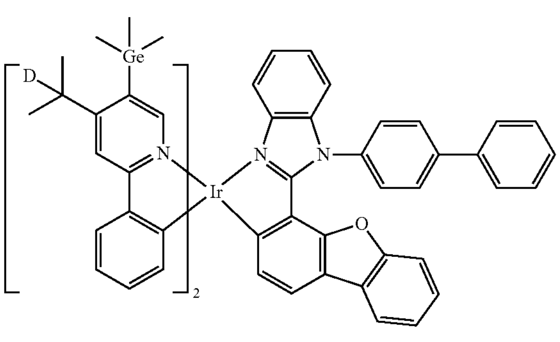
2603
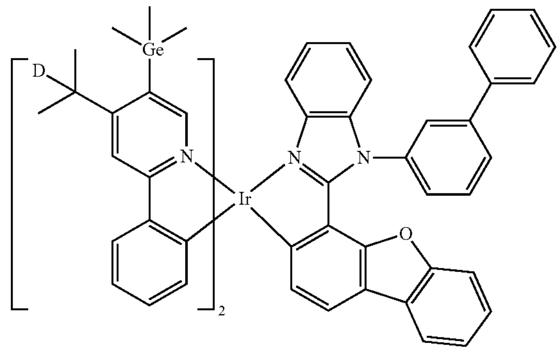
2604
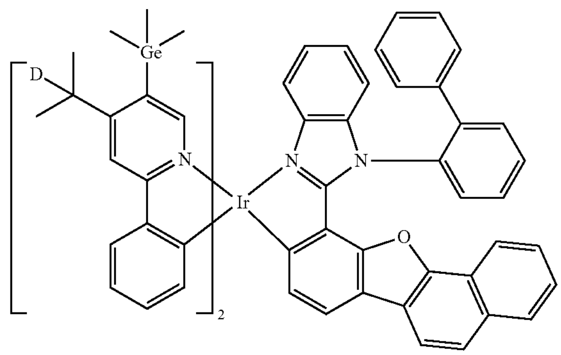
2605
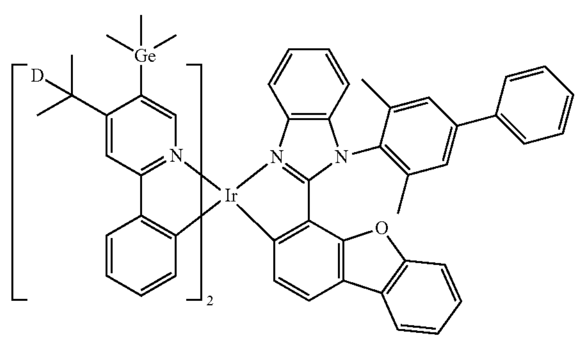
2606
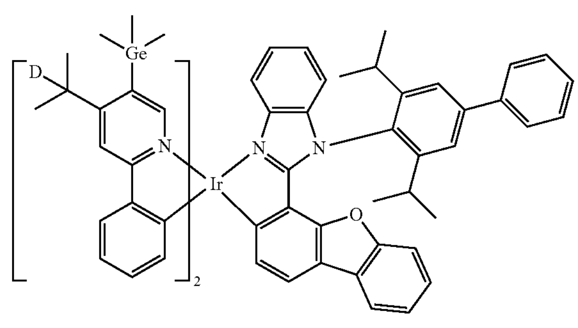

2607
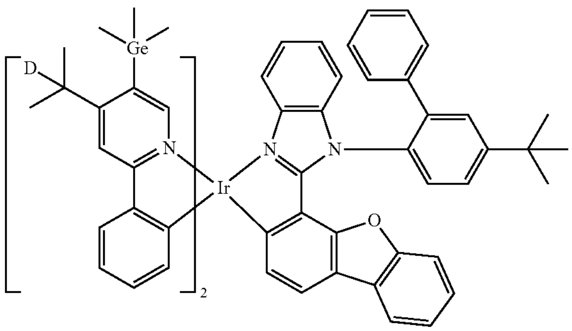
2608
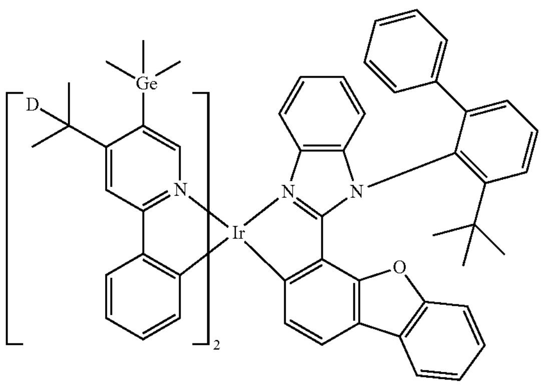
2609
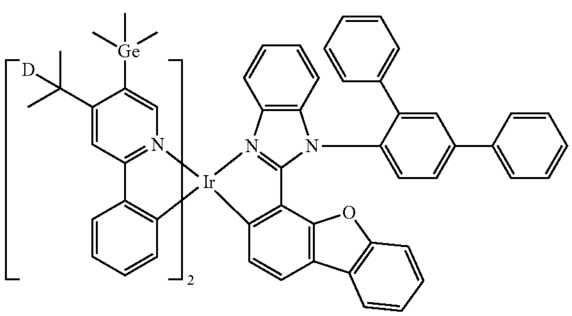
2610
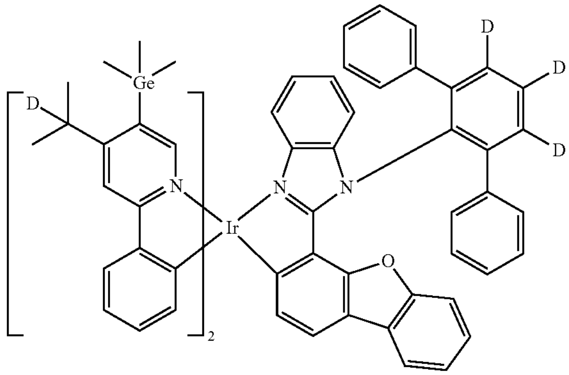
2611
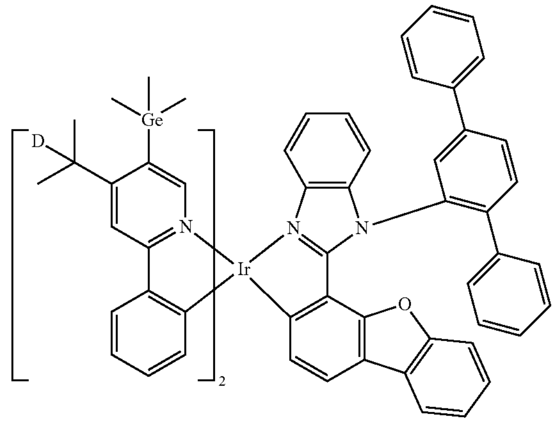
2612
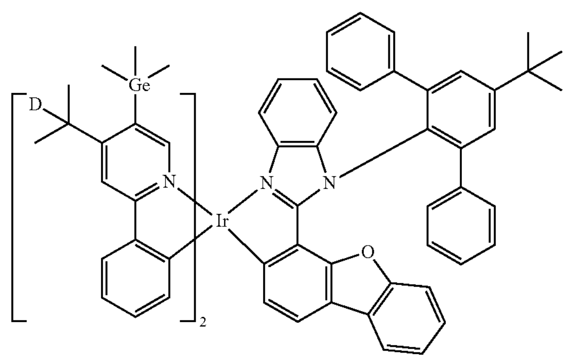
2613
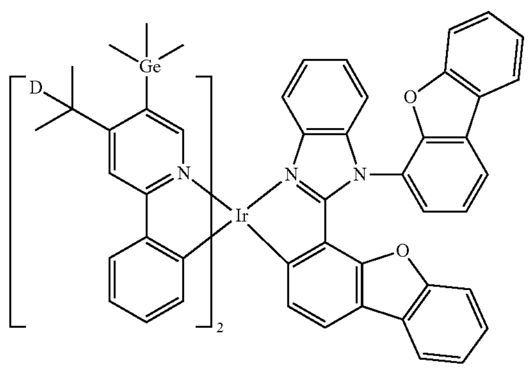
2614
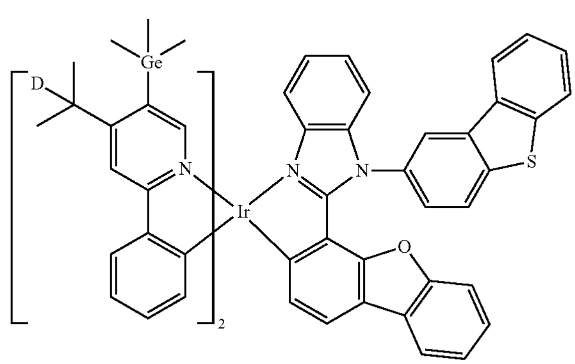

2615
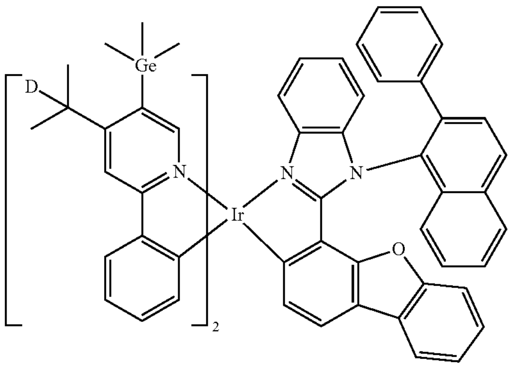
2616
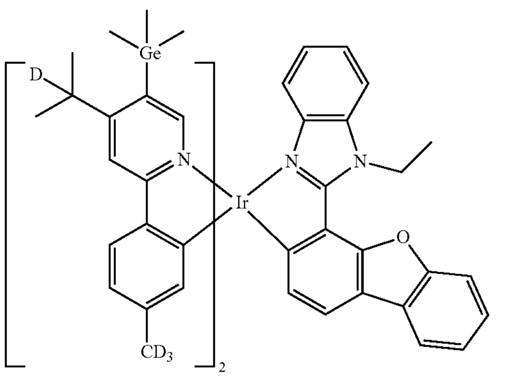
2617
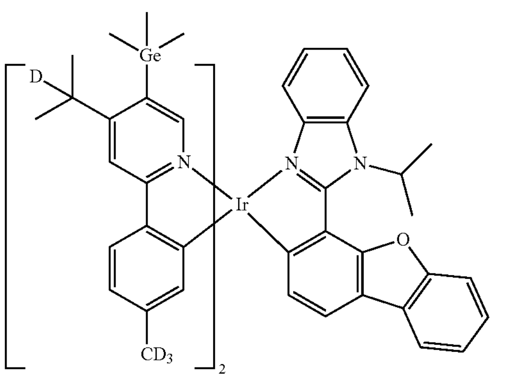
2618
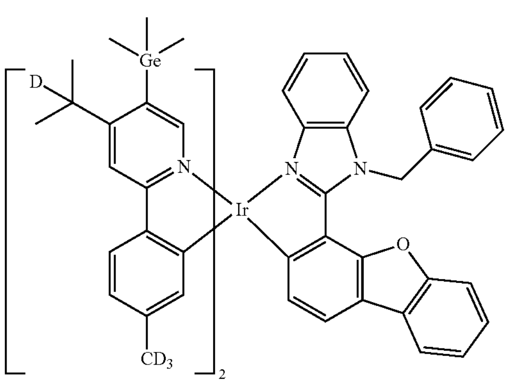
2619
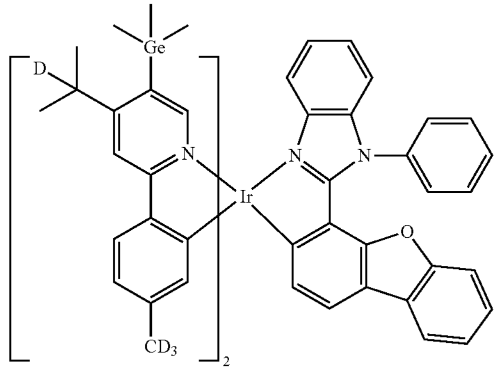
2620
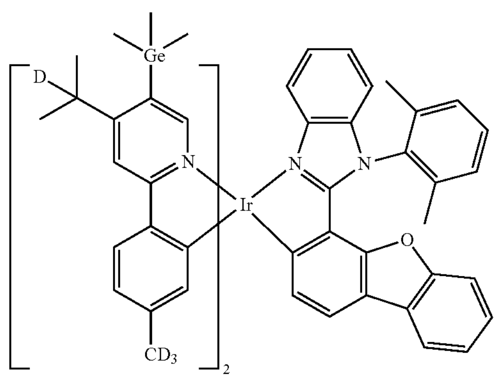
2621
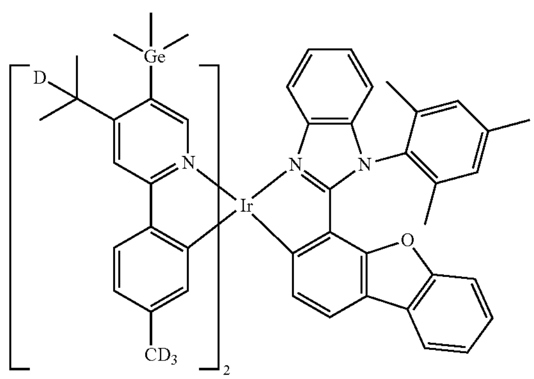
2622
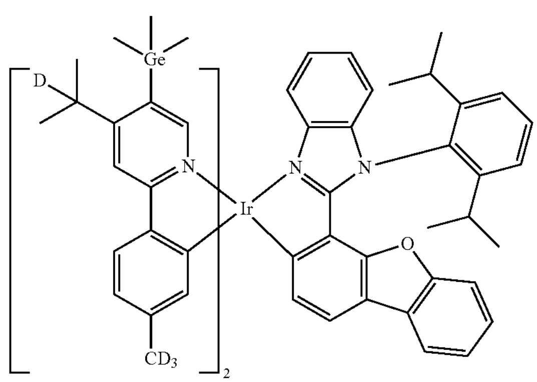

-continued
2623
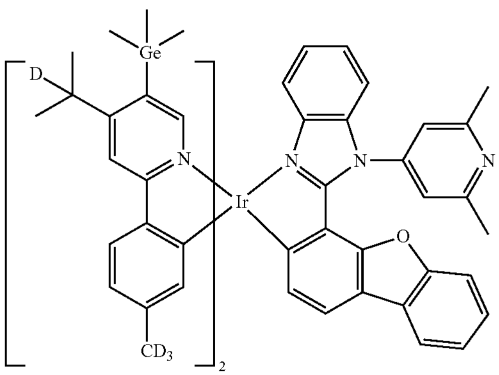
2624
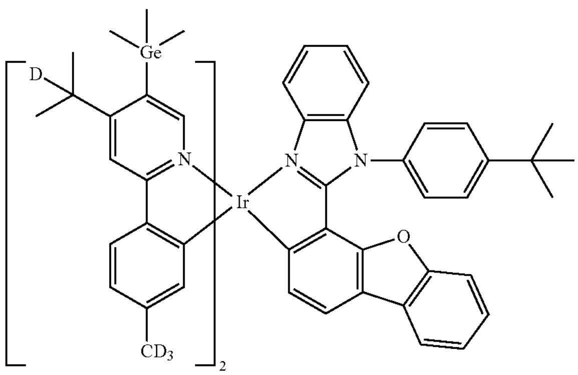
2625
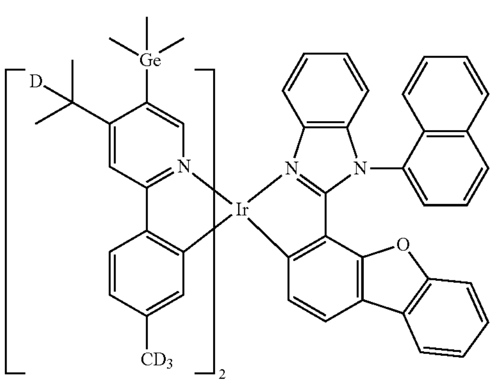
2626
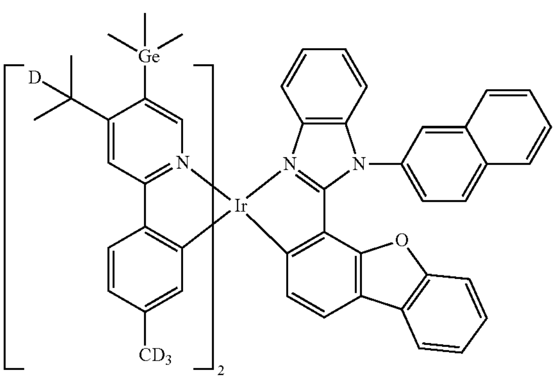
-continued
2627
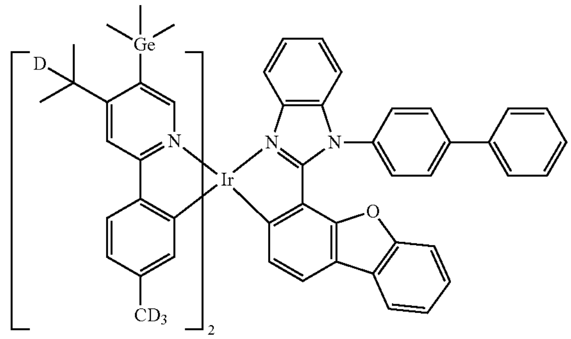
2628
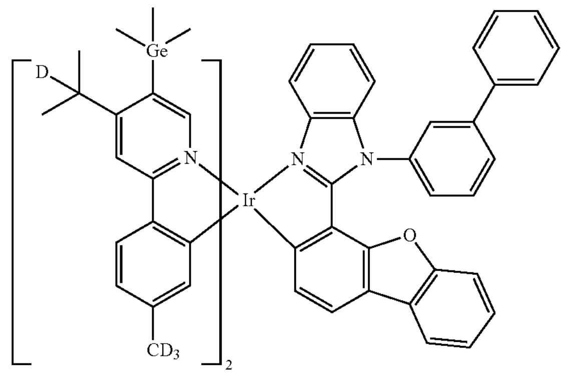
2629
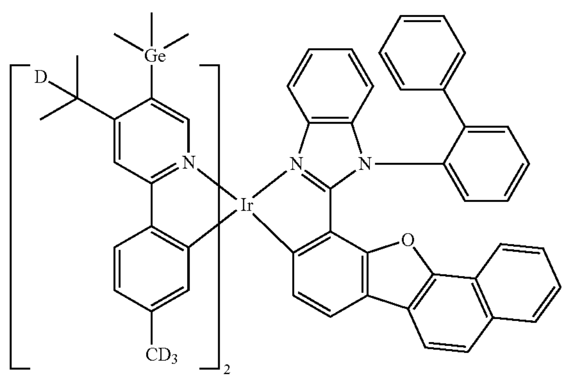
2630
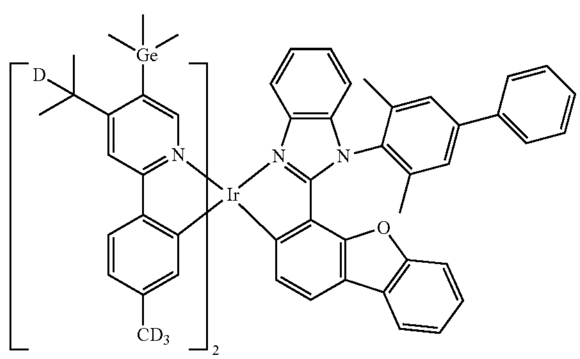

-continued
2631
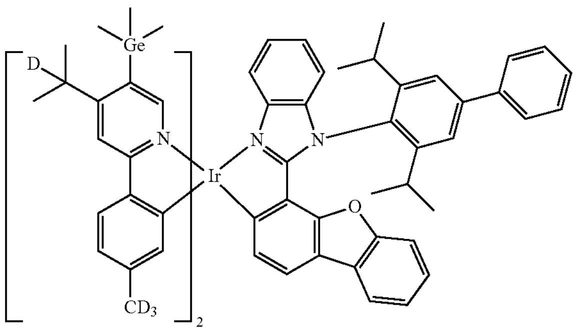
2632
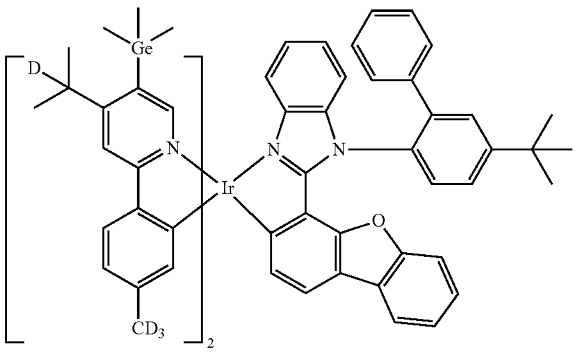
2633
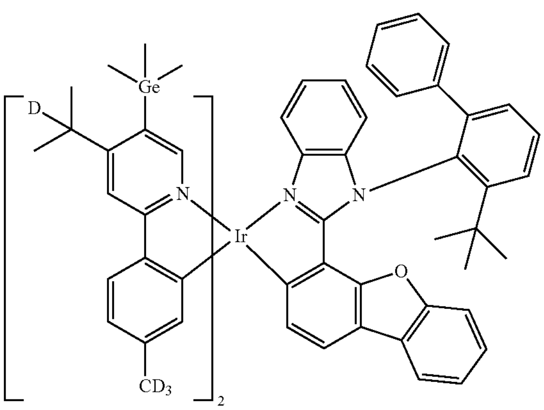
2634
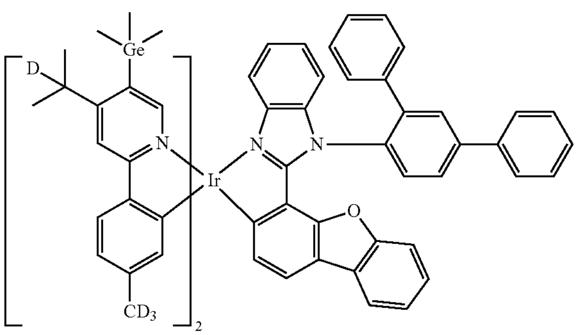
-continued
2635
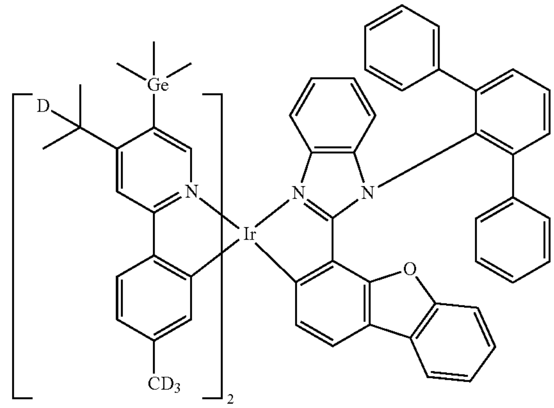
2636
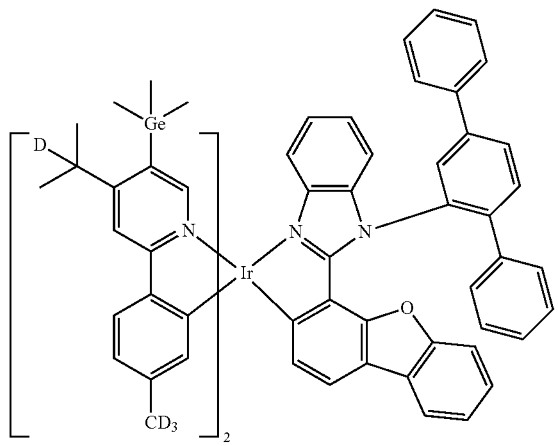
2637
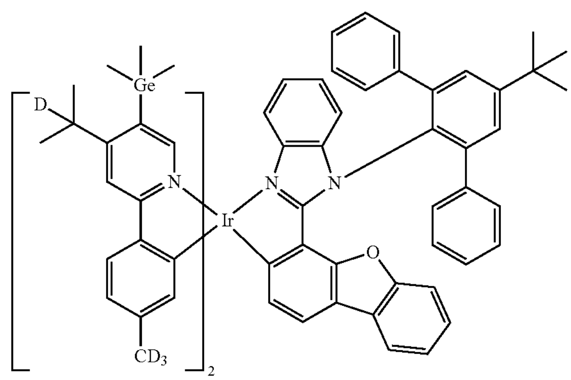

-continued
2638
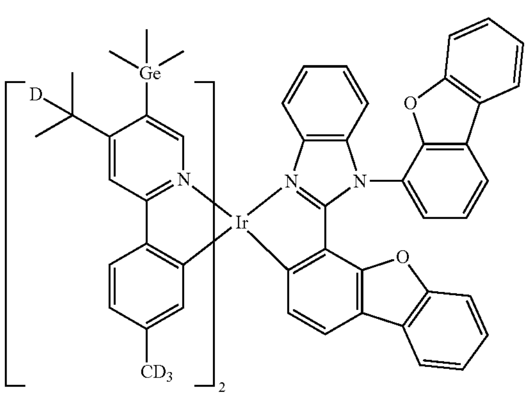
2639
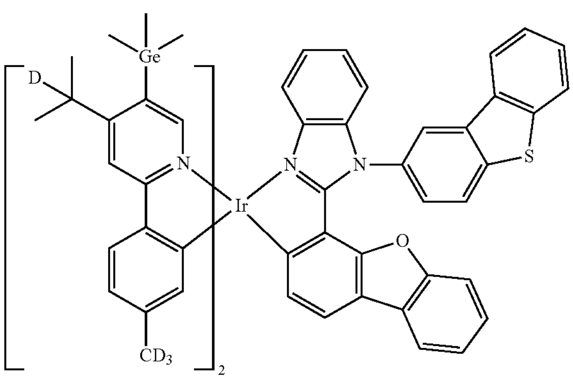
2640
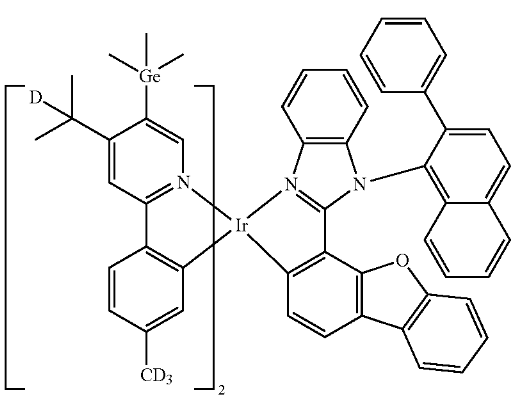
2641
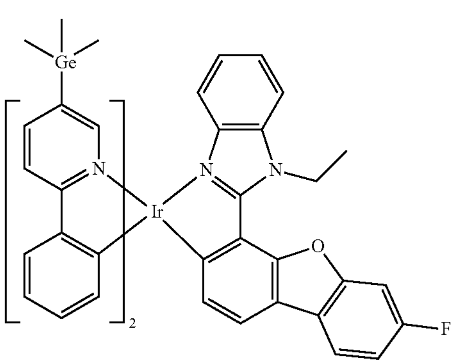
-continued
2642
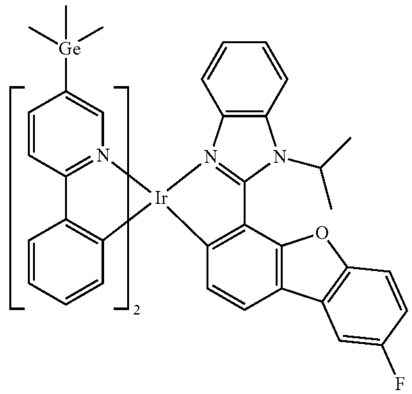
2643
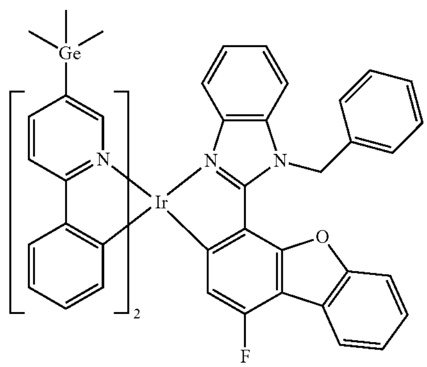
2644
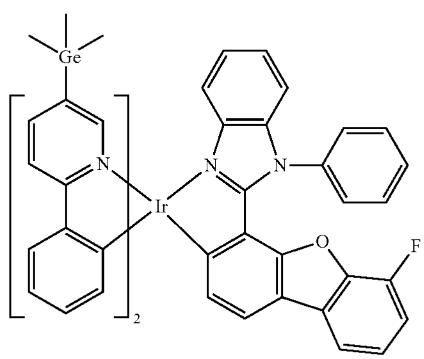
2645
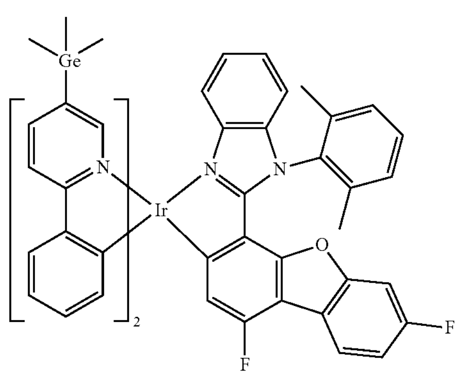

-continued
2646
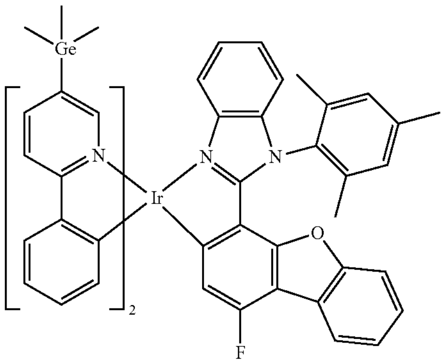
2647
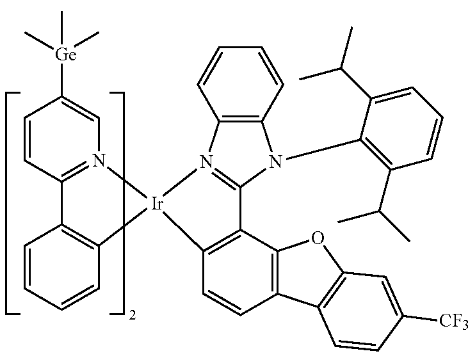
2648
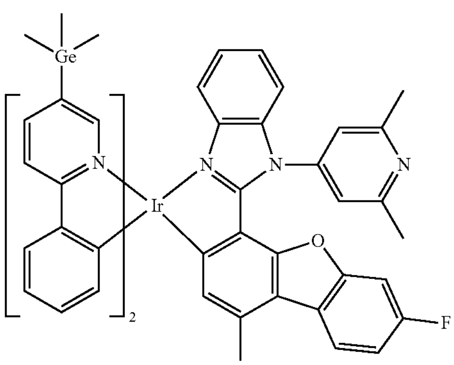
2649
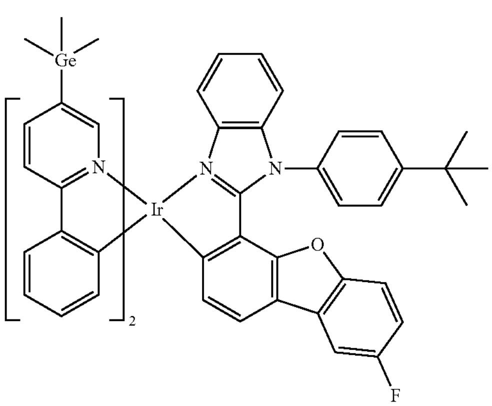
-continued
2650
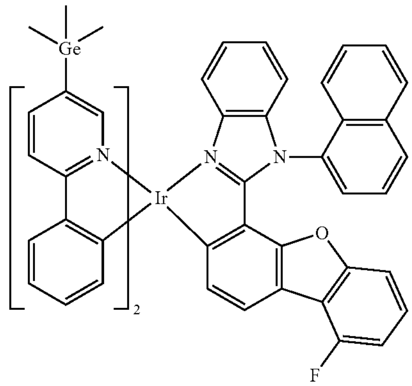
2651
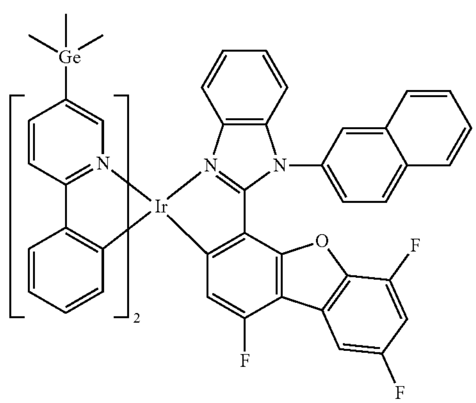
2652
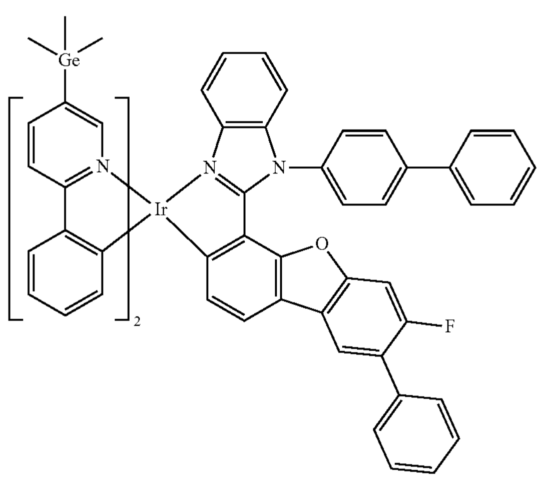

-continued
2653
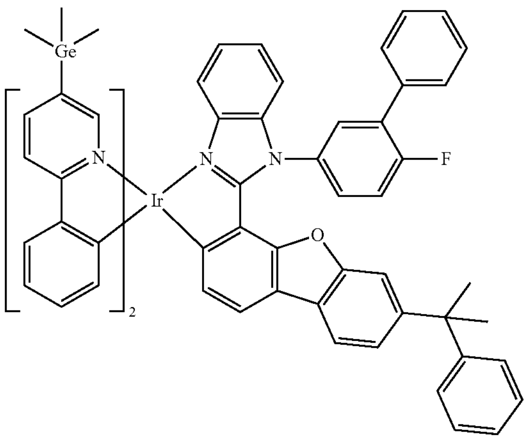
2654
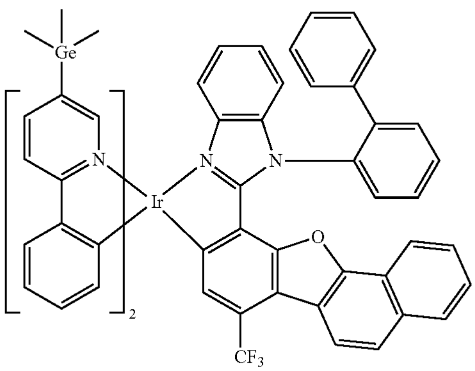
2655
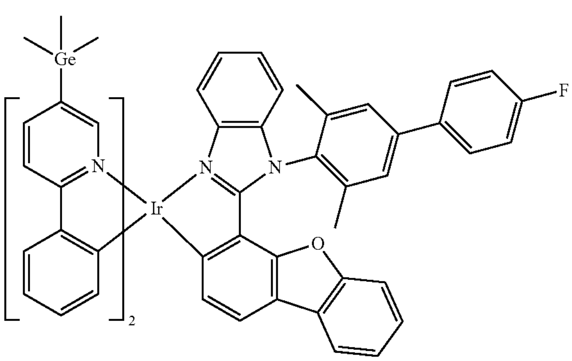
2656
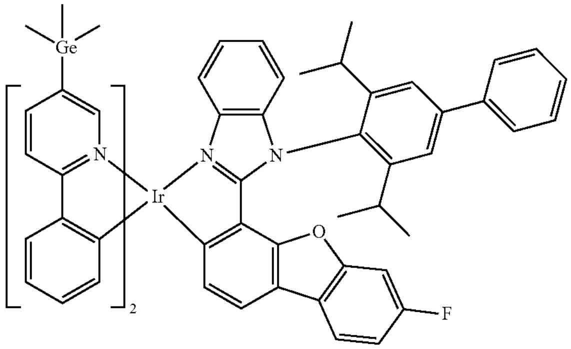
-continued
2657
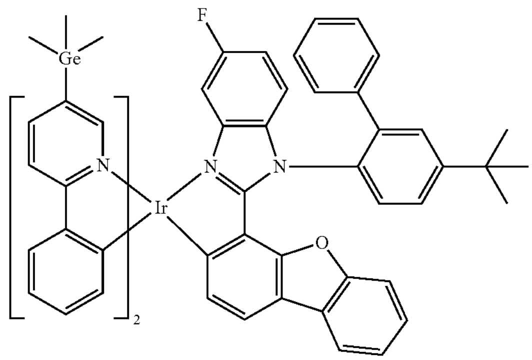
2658
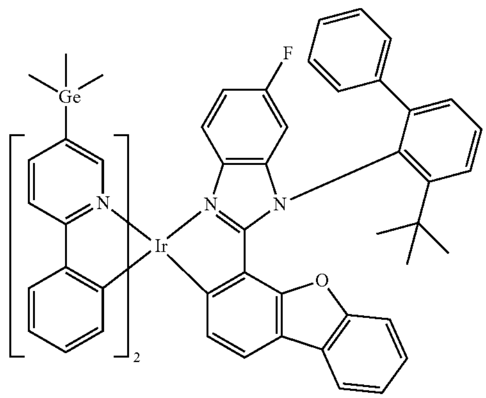
2659
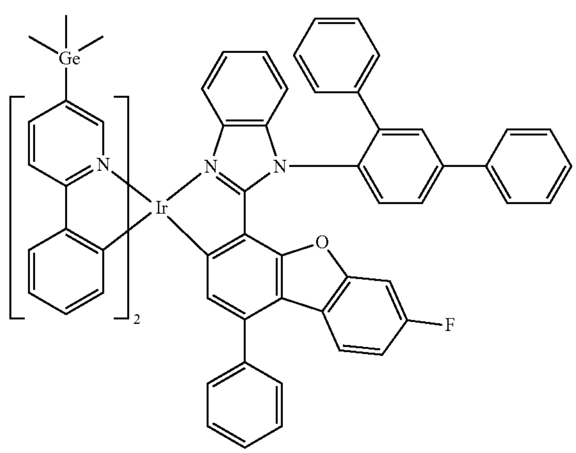
2660
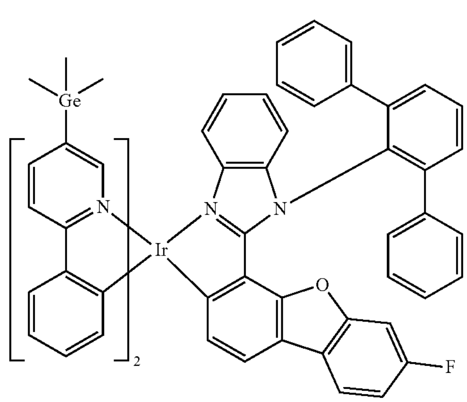

-continued
2661
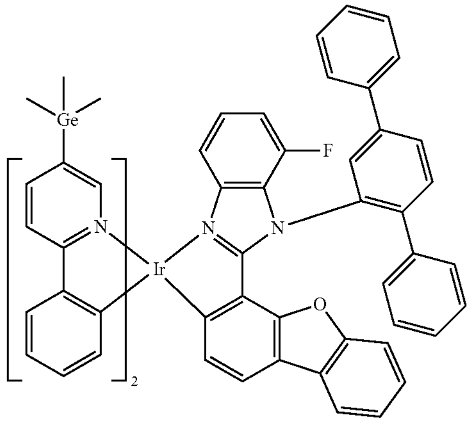
2662
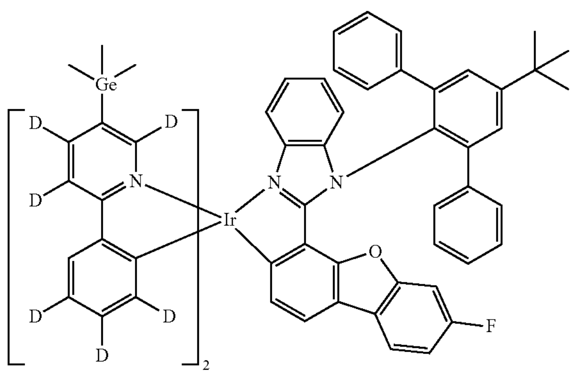
2663
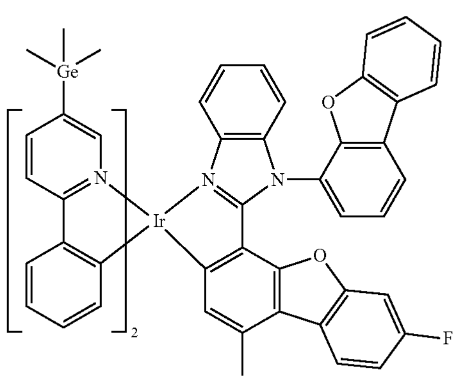
-continued
2664
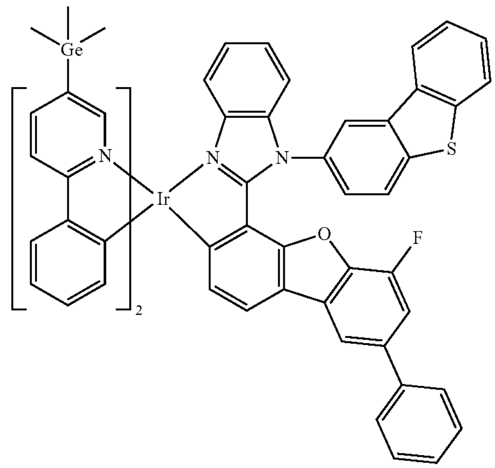
2665
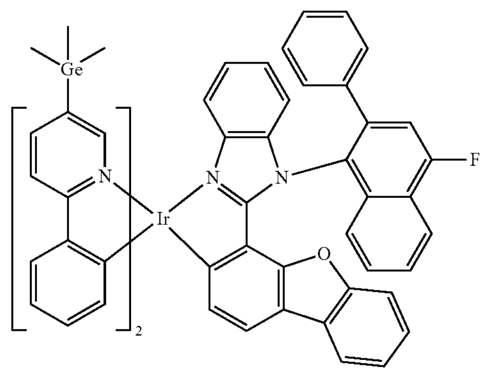
2666
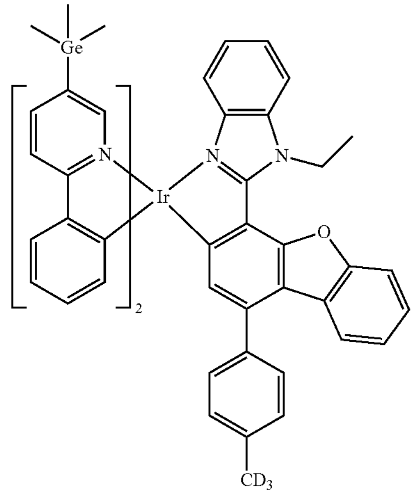

-continued
2667
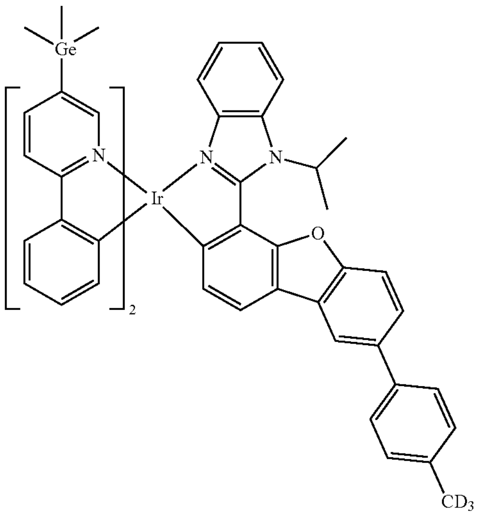
2668
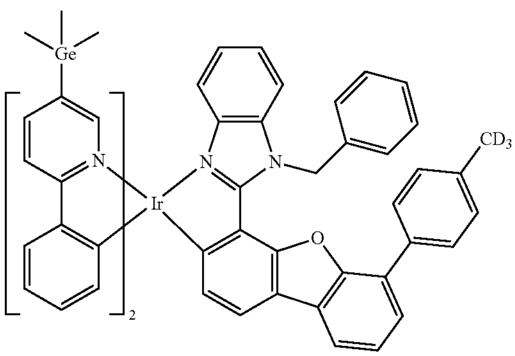
2669
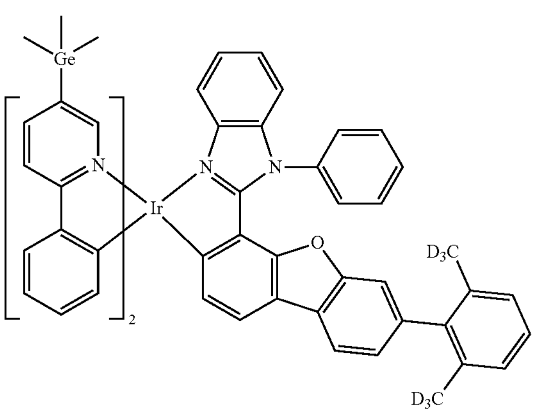
-continued
2670
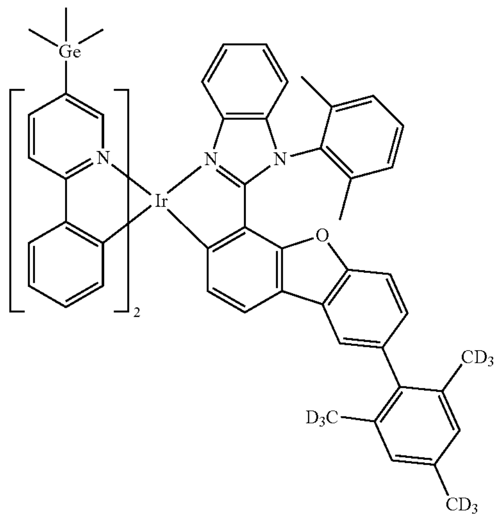
2671
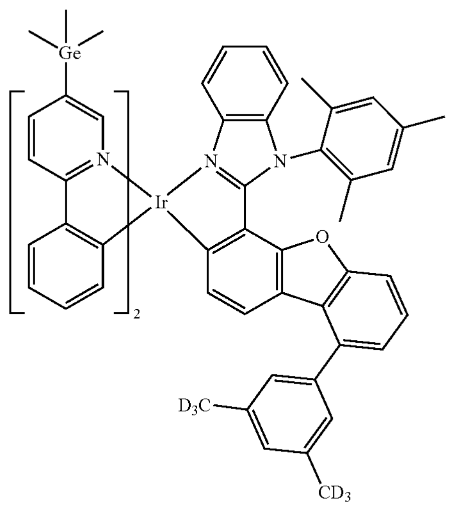
2672
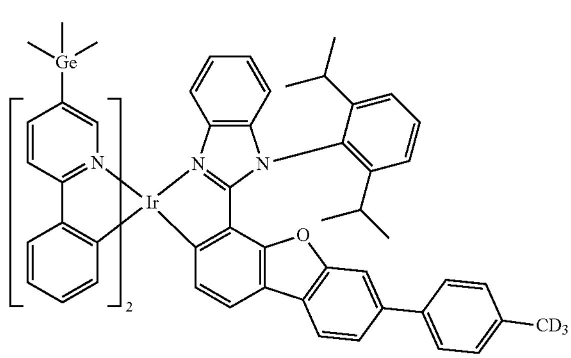

-continued
2673
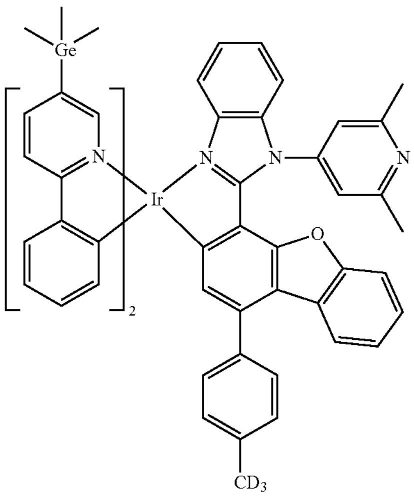
2674
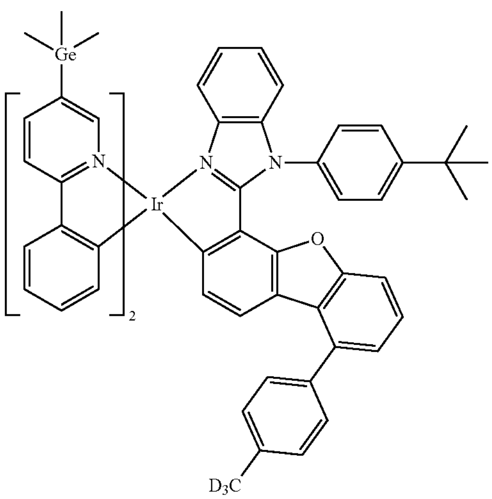
2675
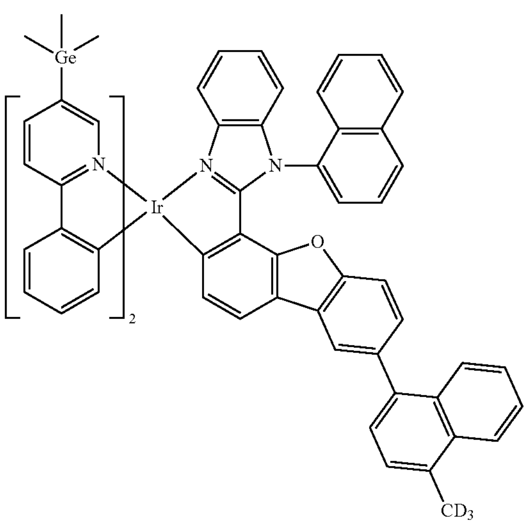
-continued
2676
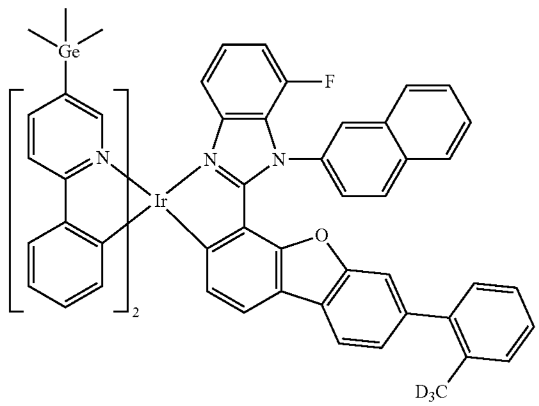
2677
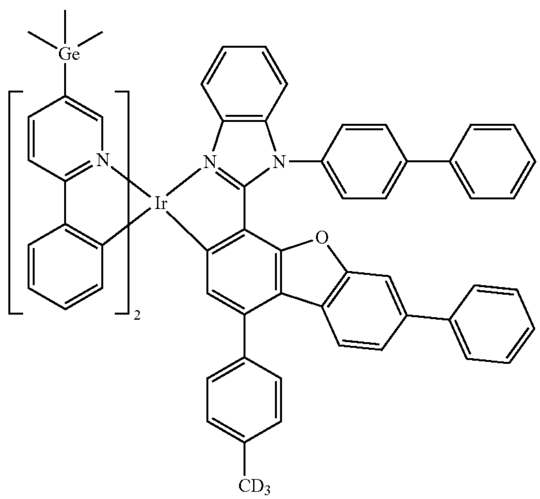
2678
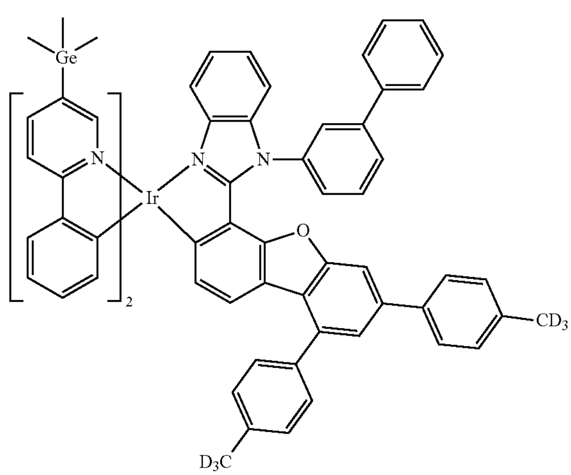

-continued
2679
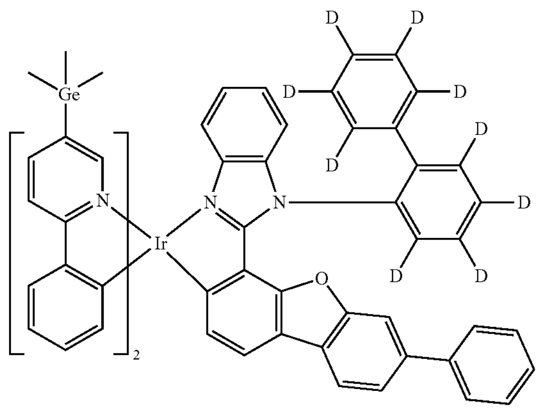
2680
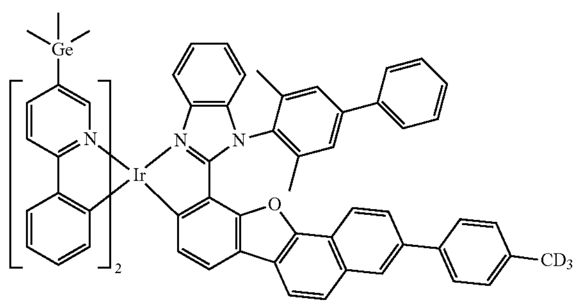
2681
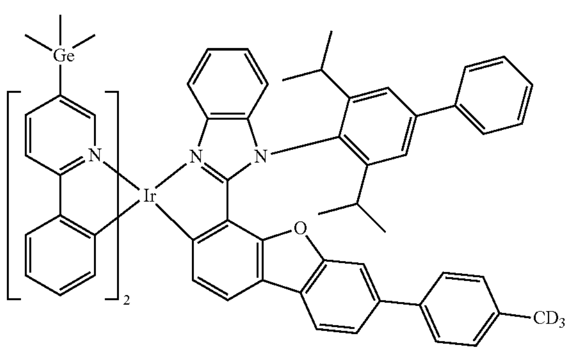
2682
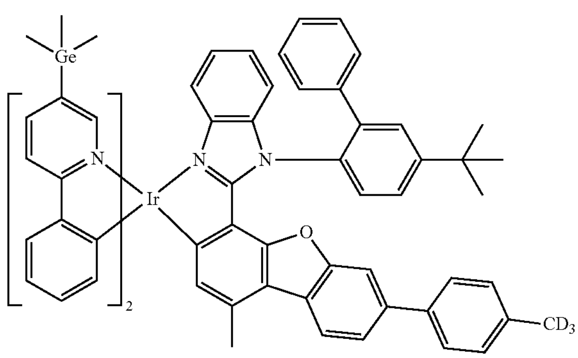
-continued
2683
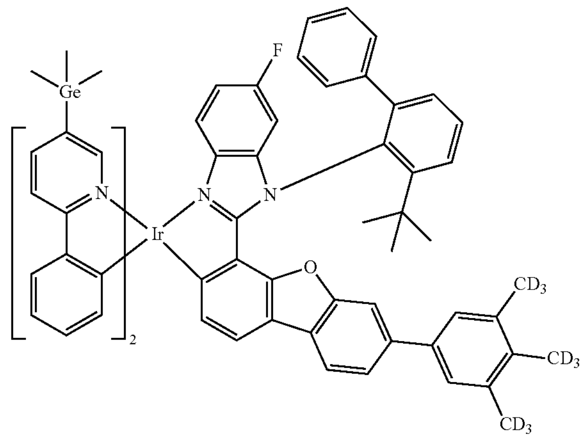
2684
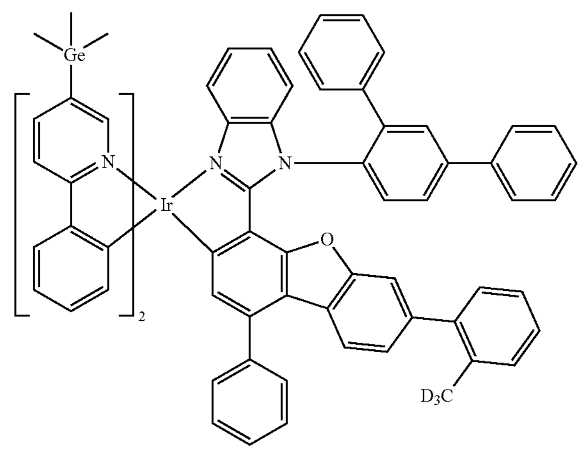
2685
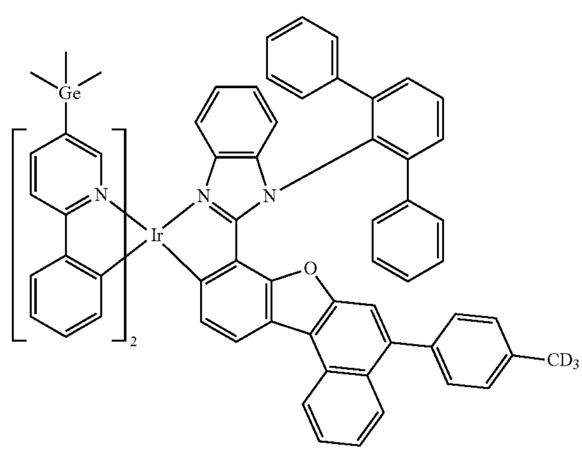

-continued
2686
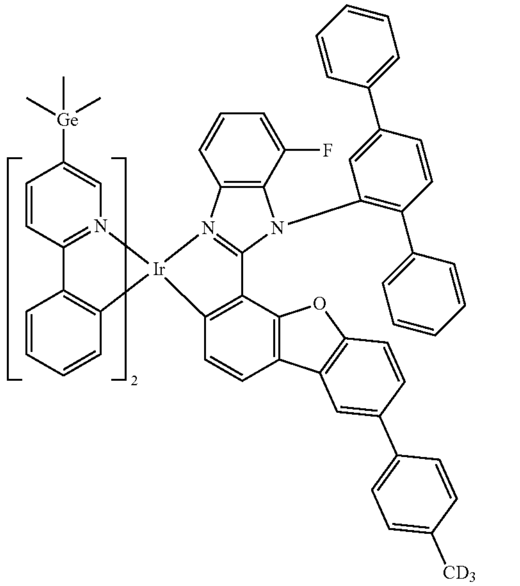
2687
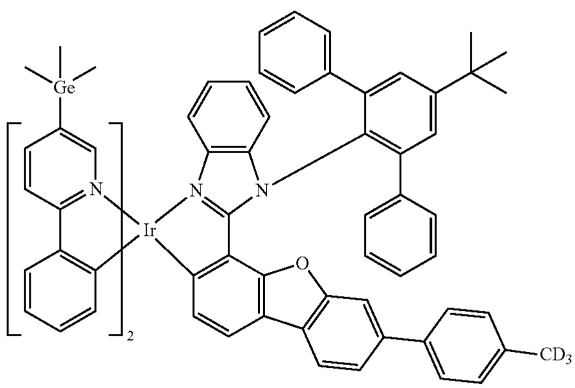
2688
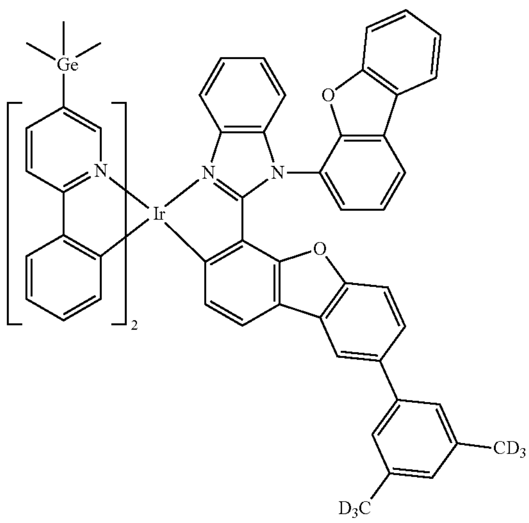
-continued
2689
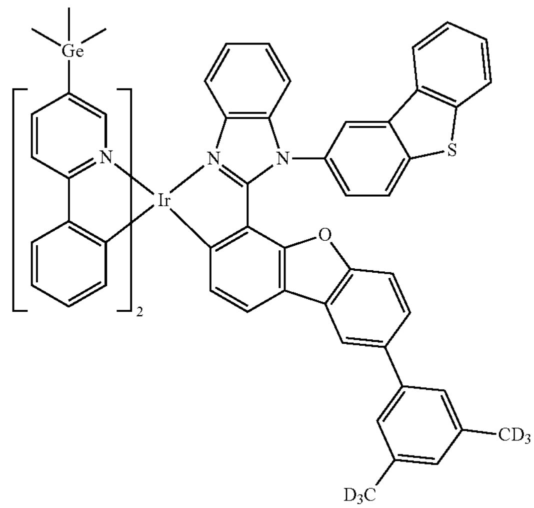
2690
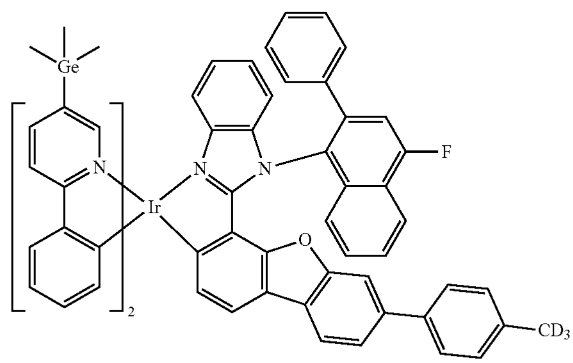
2691
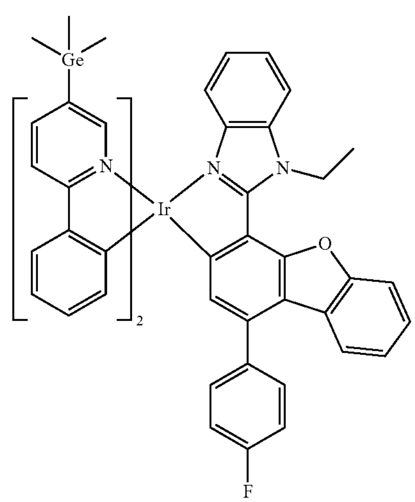

-continued
2692
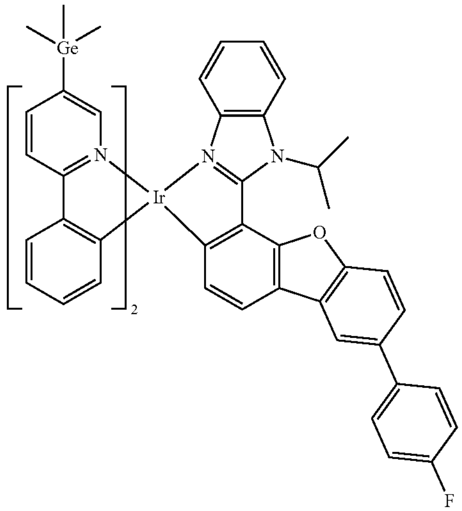
2693
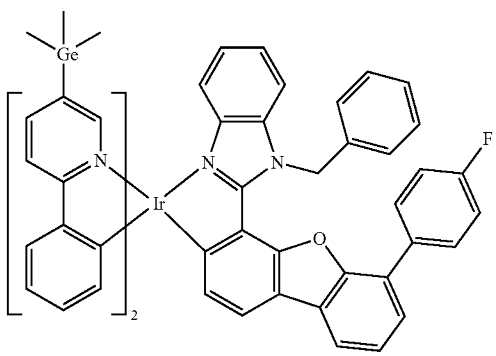
2694
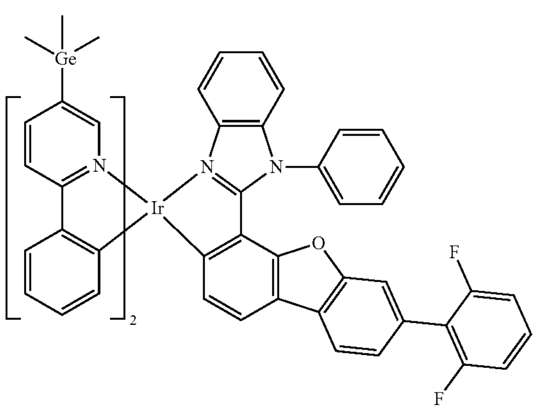
-continued
2695
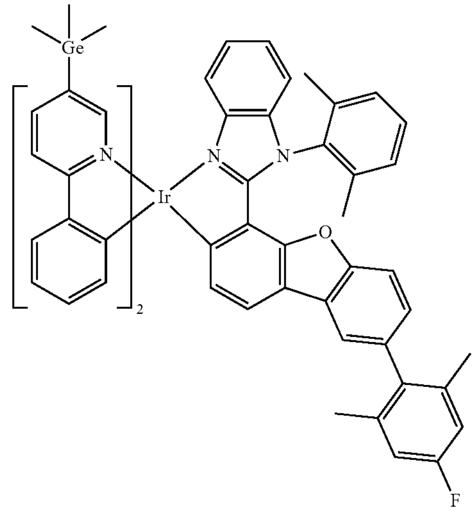
2696
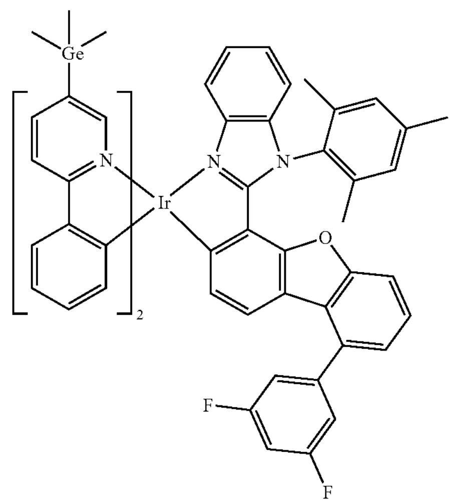
2697
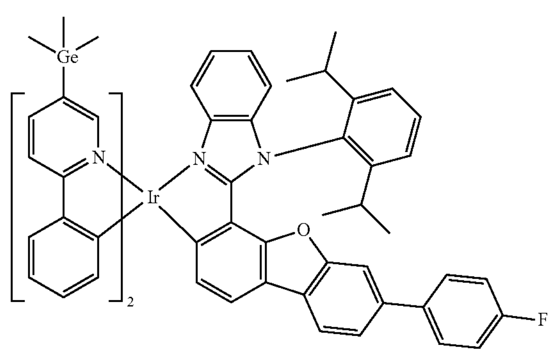

-continued
2698
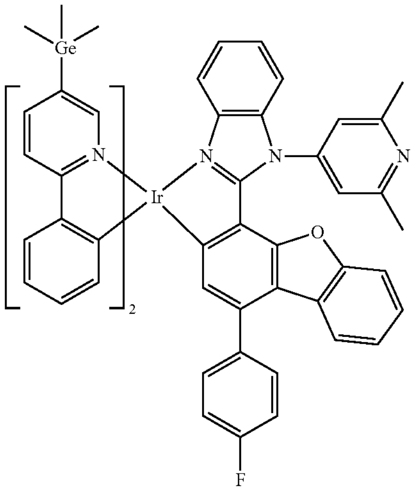
2699
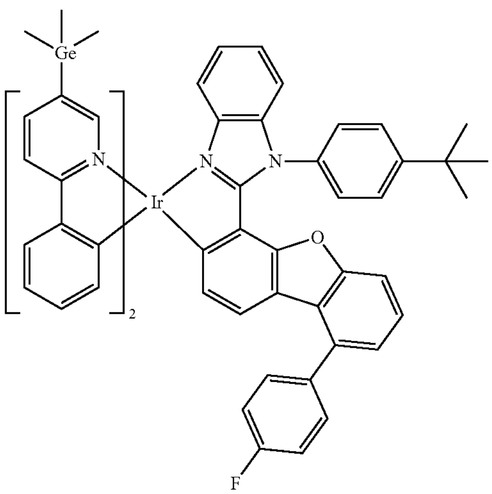
2700
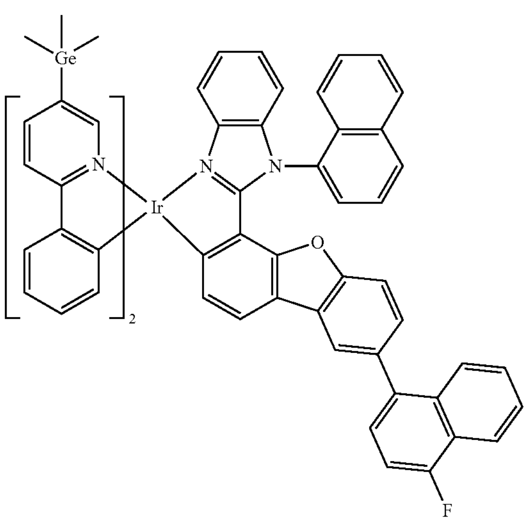
-continued
2701
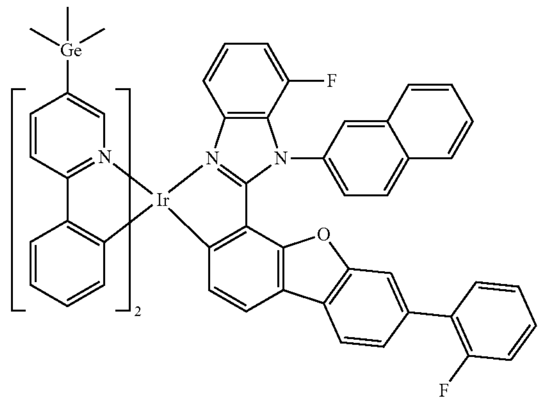
2702
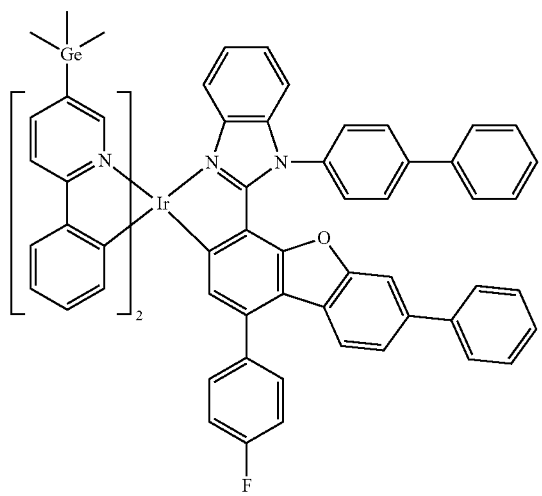
2703
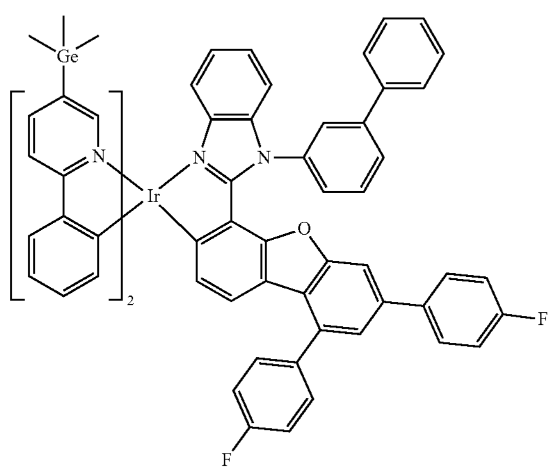

-continued
2704
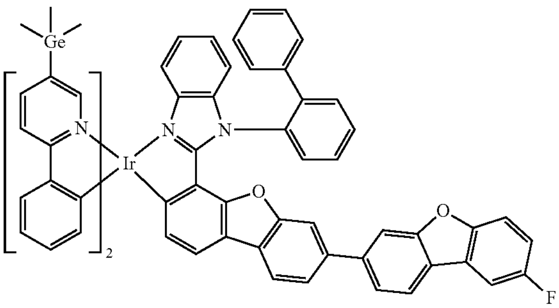
2705
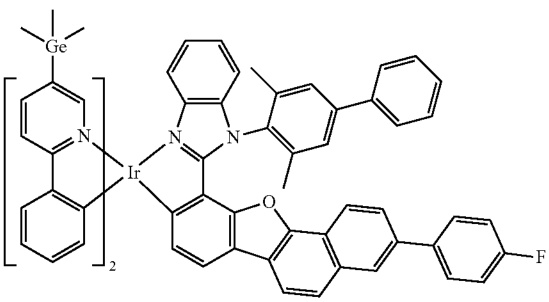
2706
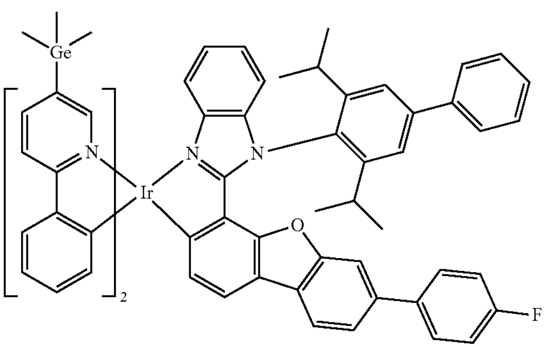
2707
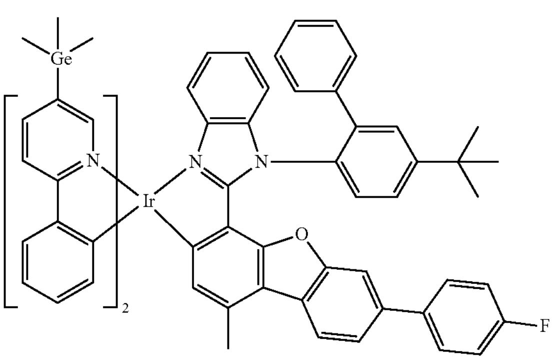
-continued
2708
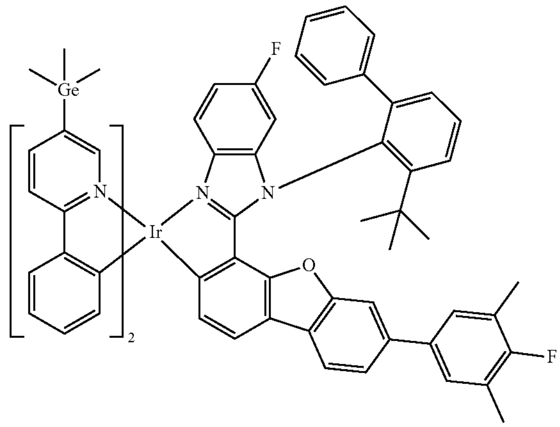
2709
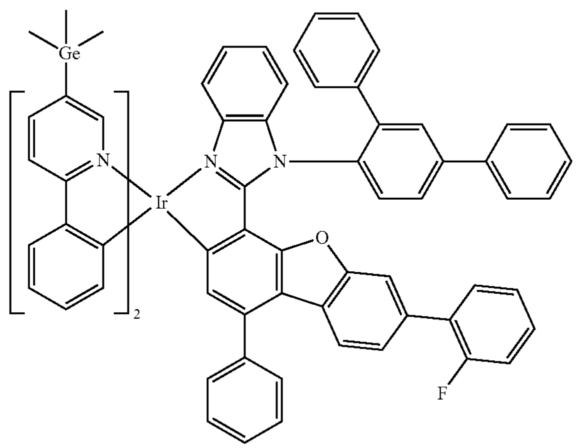
2710
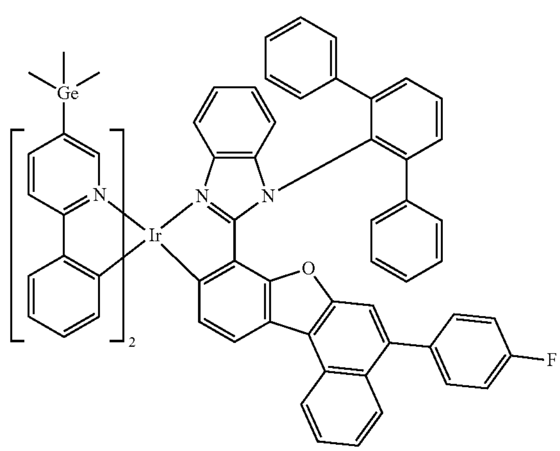

2711
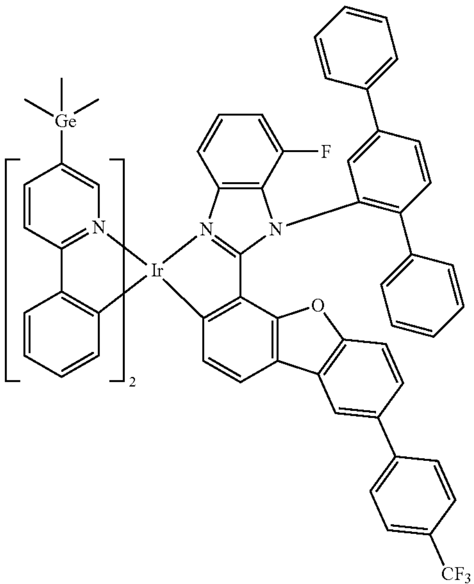
2712
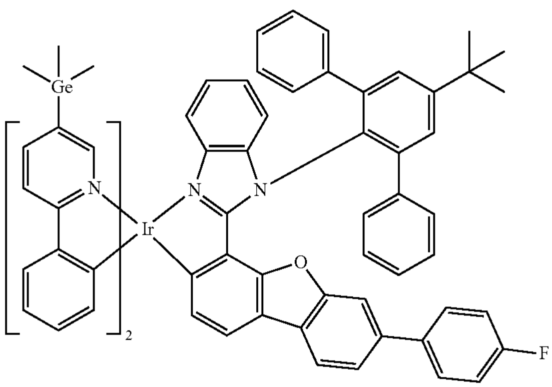
2713
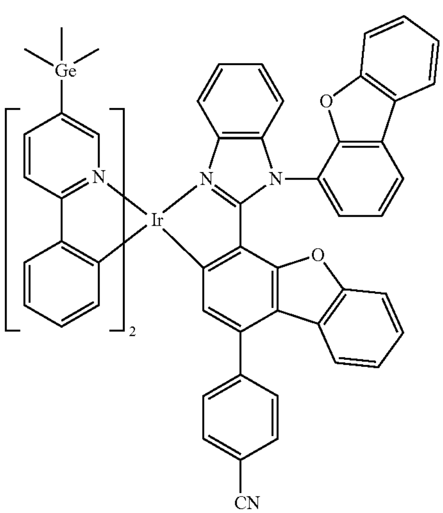
2714
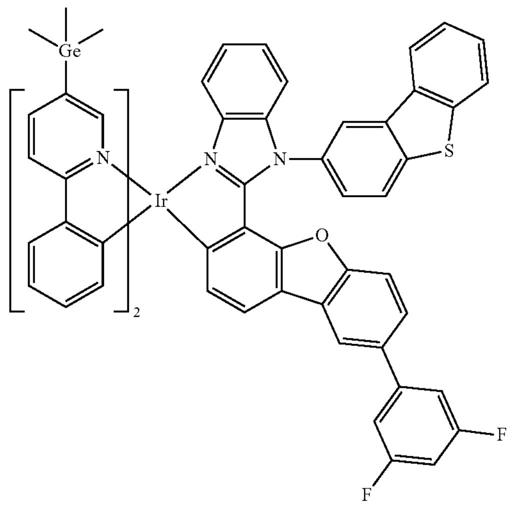
2715
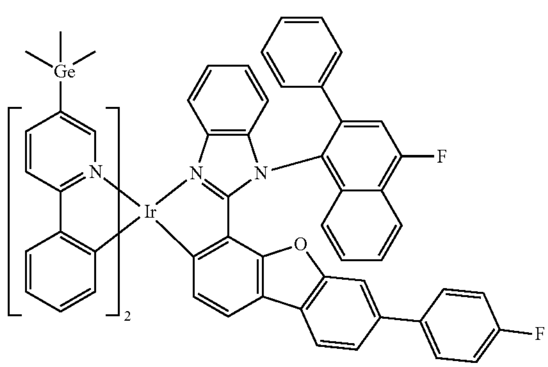

2716
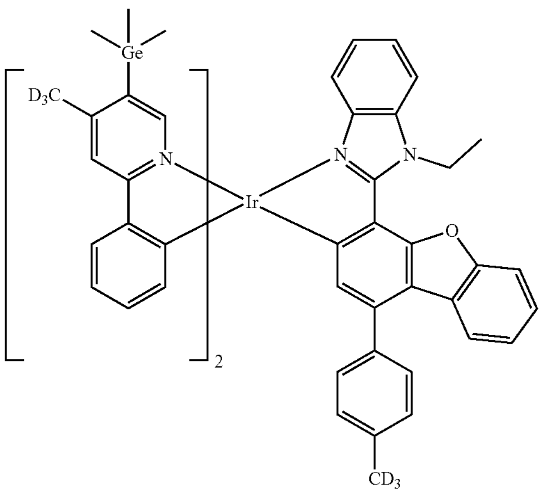
2717
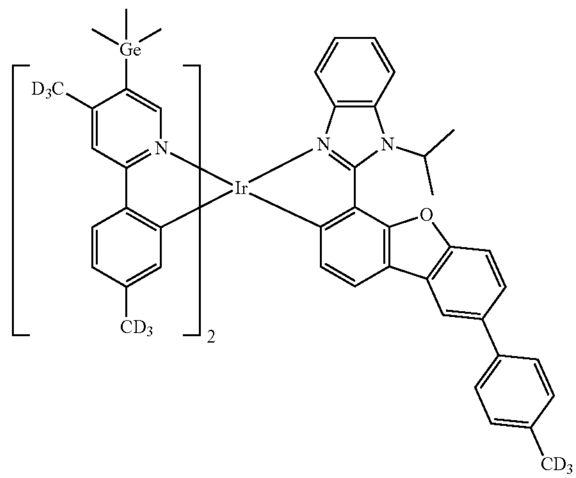
2718
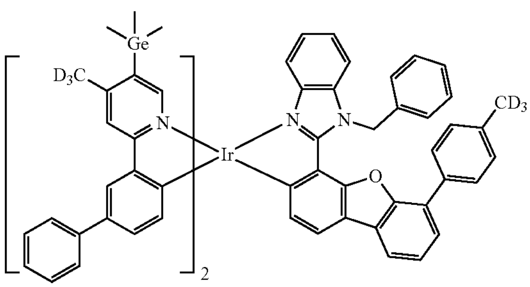
2719
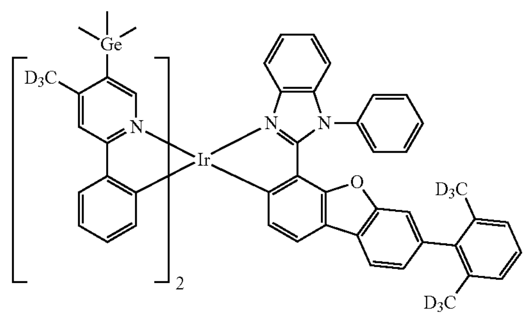
2720
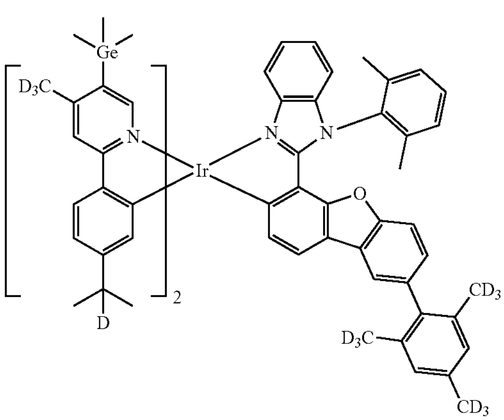
2721
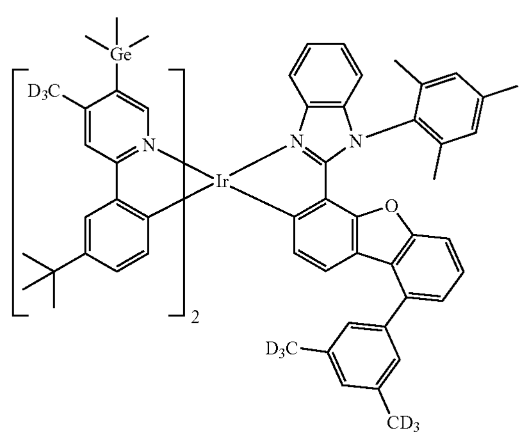

-continued
2722
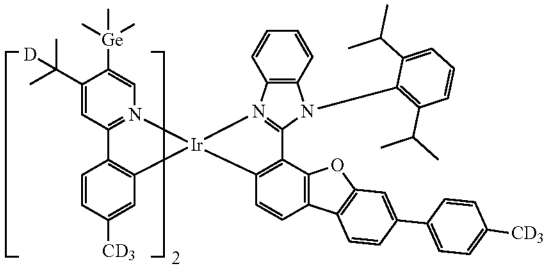
2723
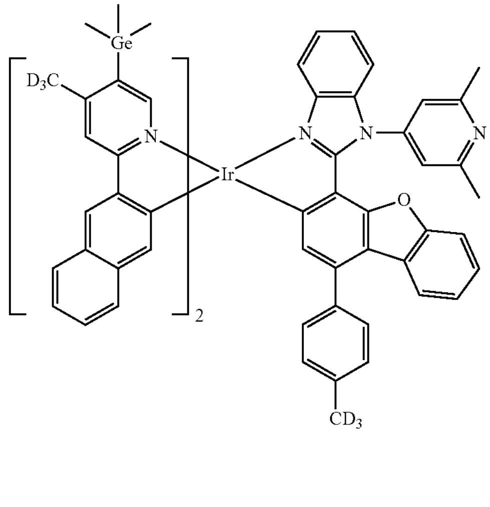
2724
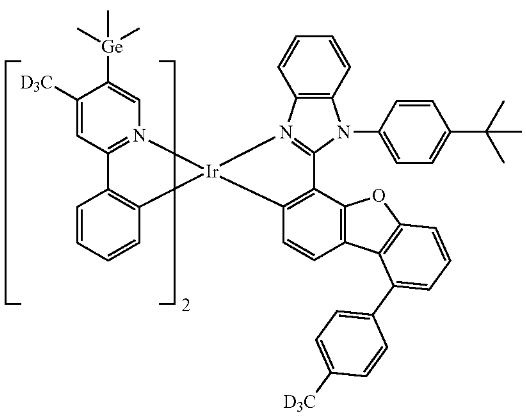
2725
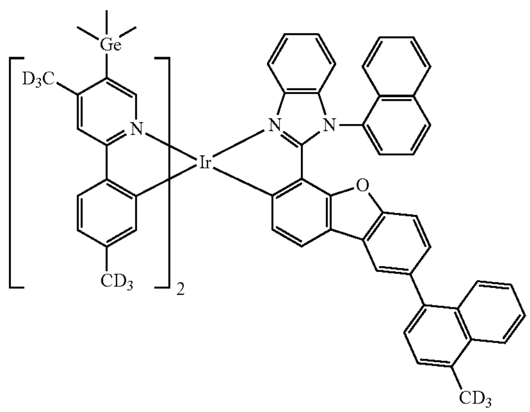
2726
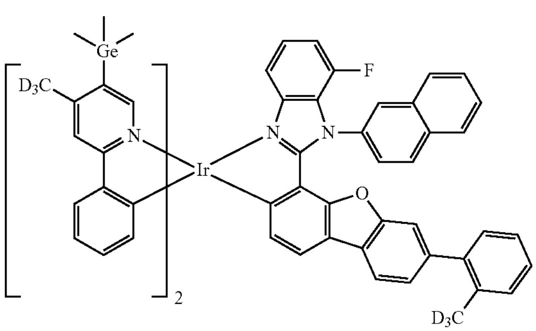
2727
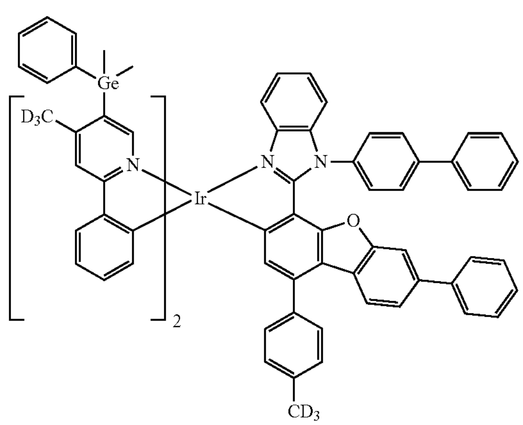

-continued
2728
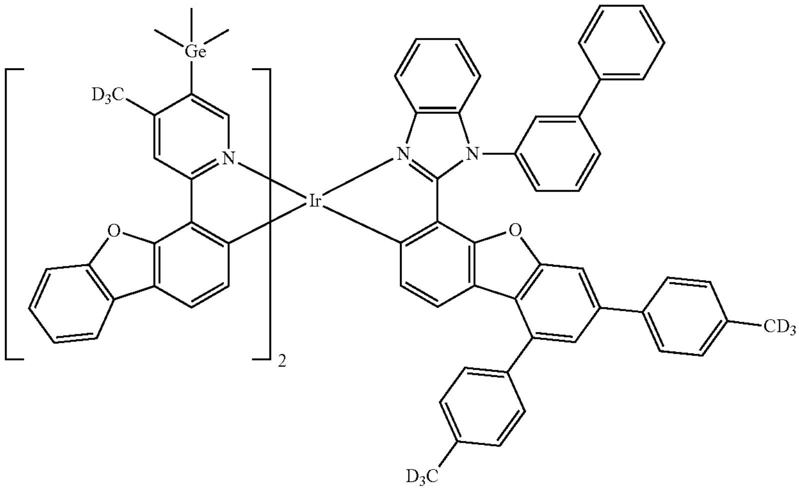
2729
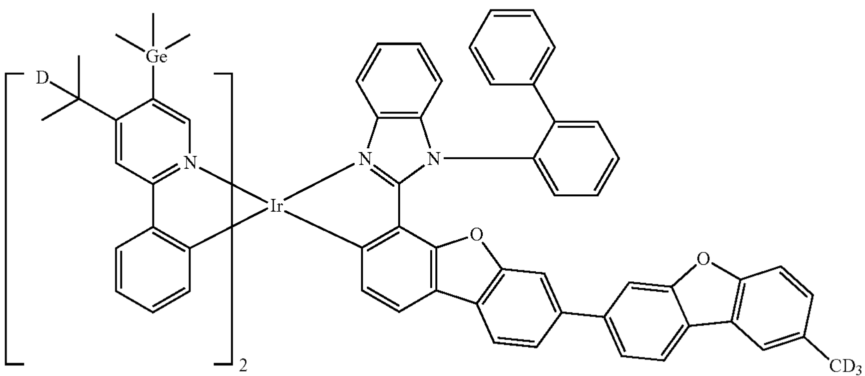
2730
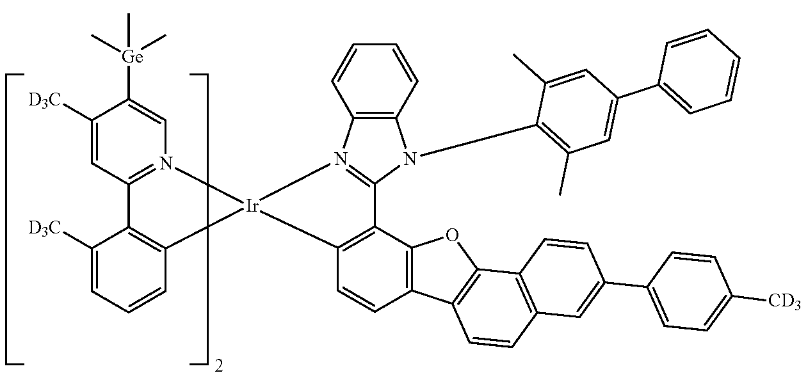
2731
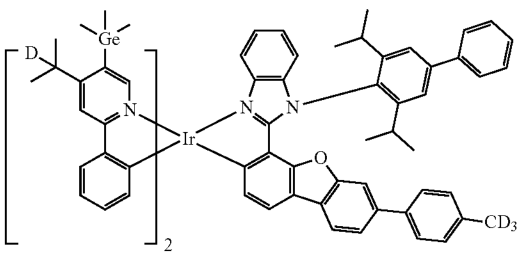
2732
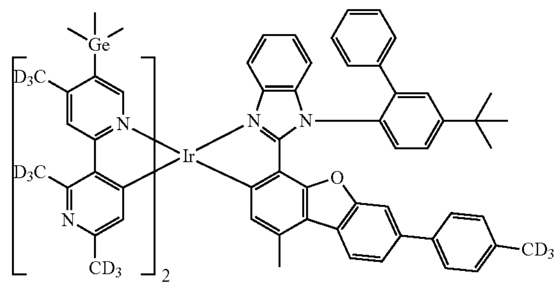

-continued
2733
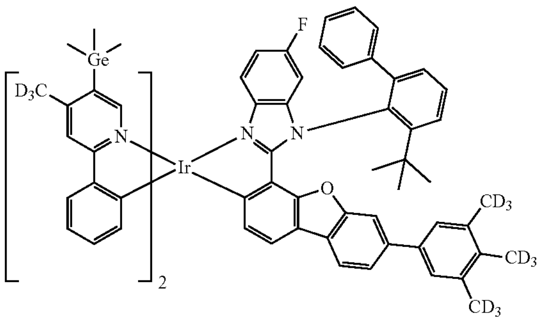
2734
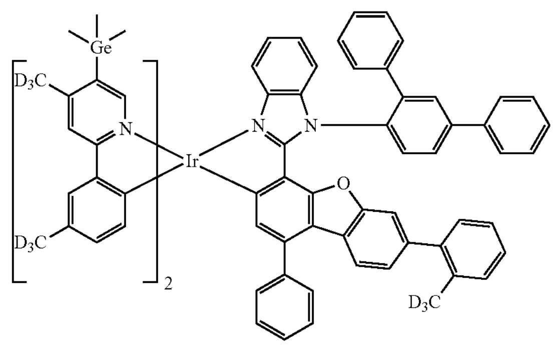
2735
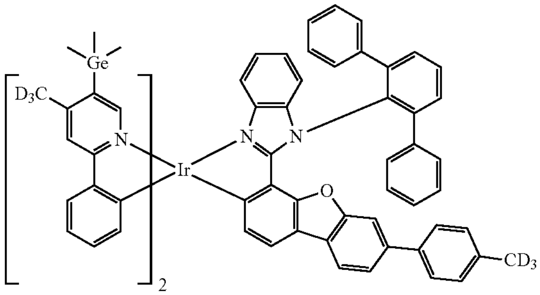
2736
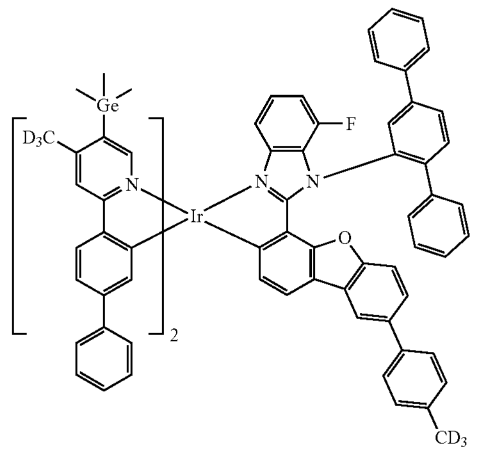
2737
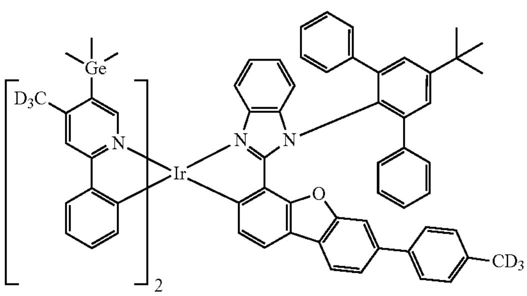
2738
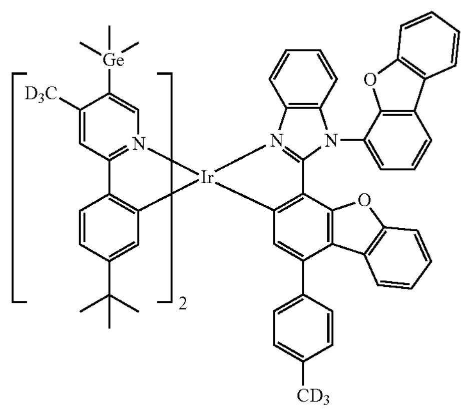
2739
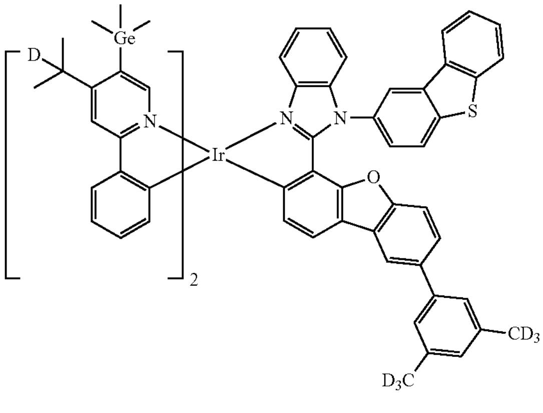
2740
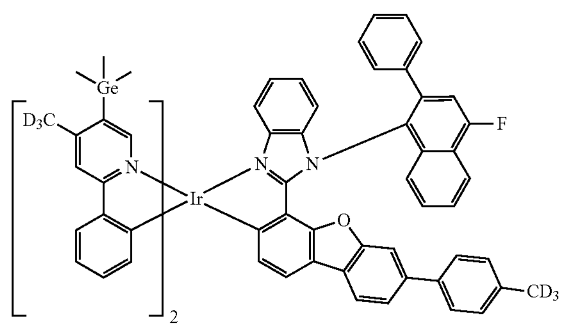

-continued
2741
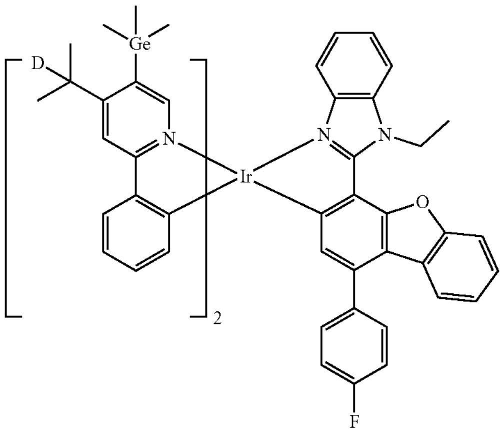
2742
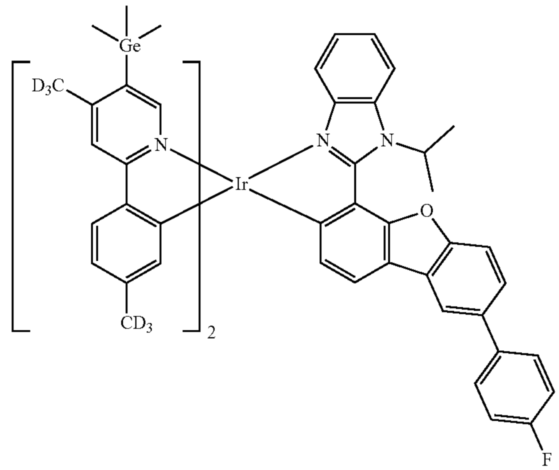
2743
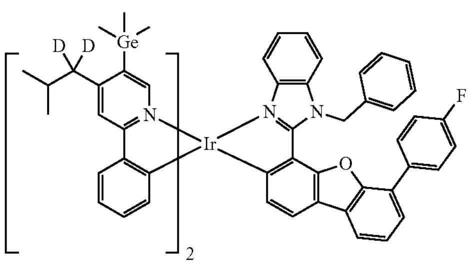
2744
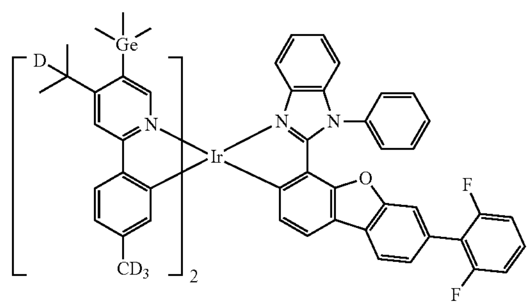
2745
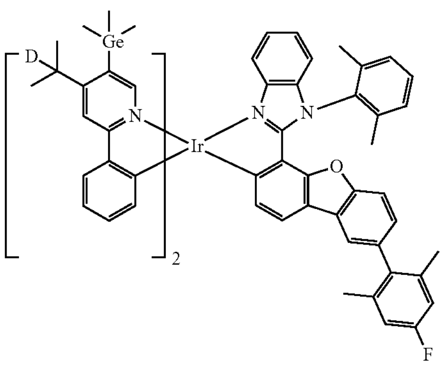
2746
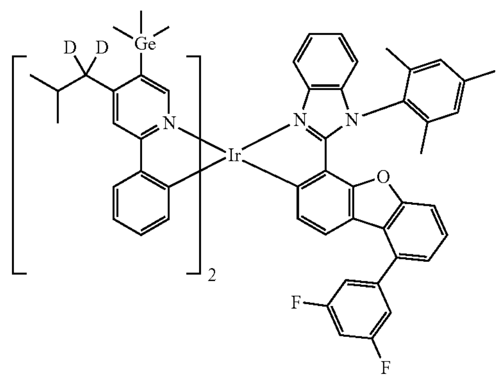
2747
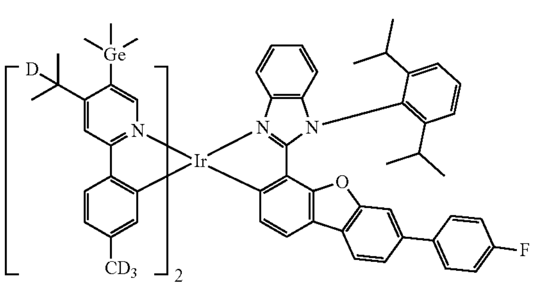
2748
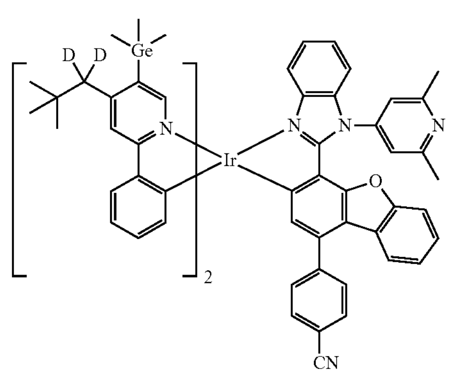

-continued
2749
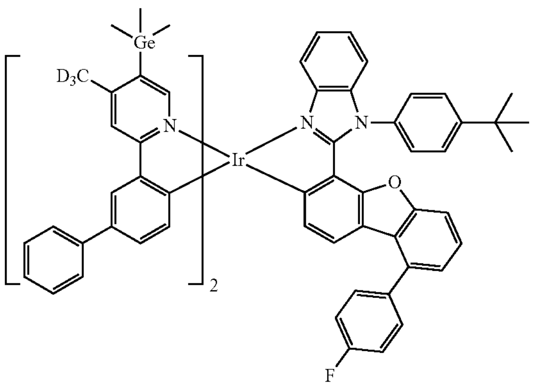
2750
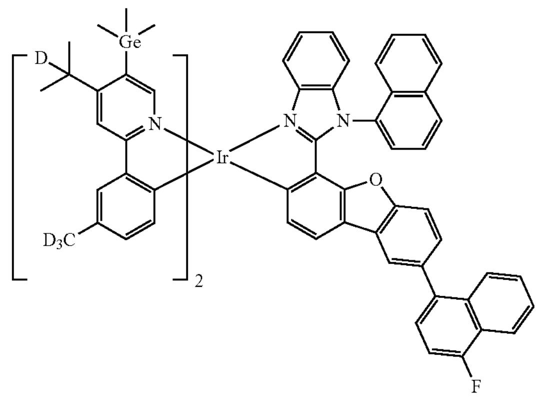
2751
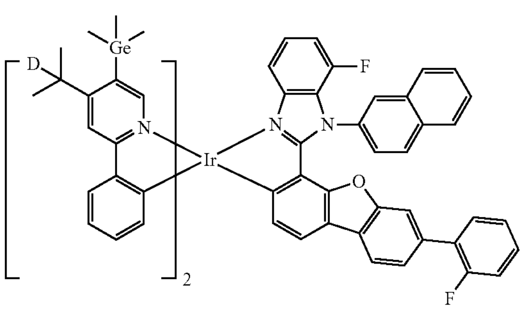
2752
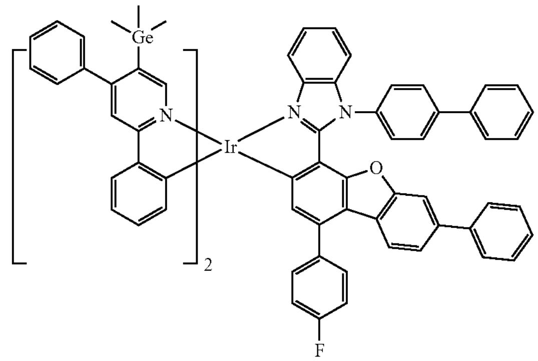
2753
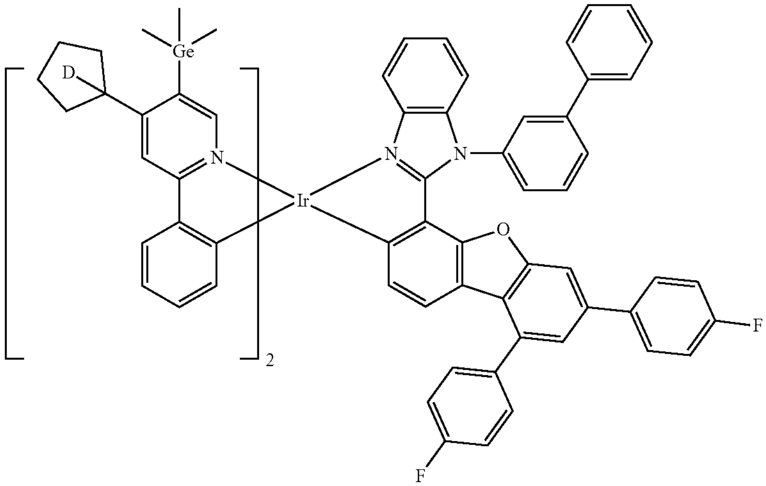

-continued
2754
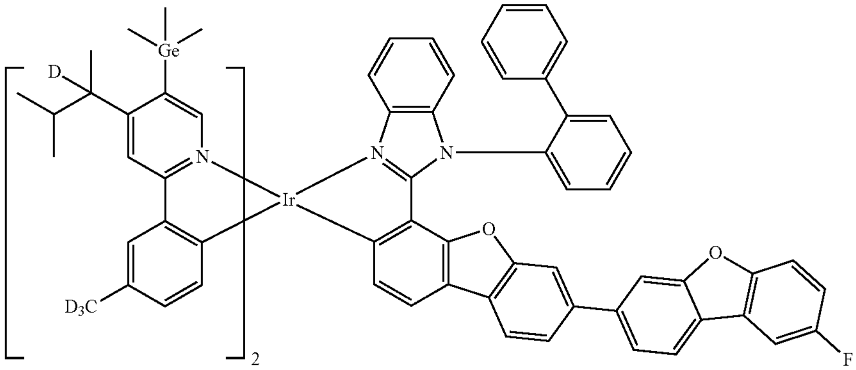
2755
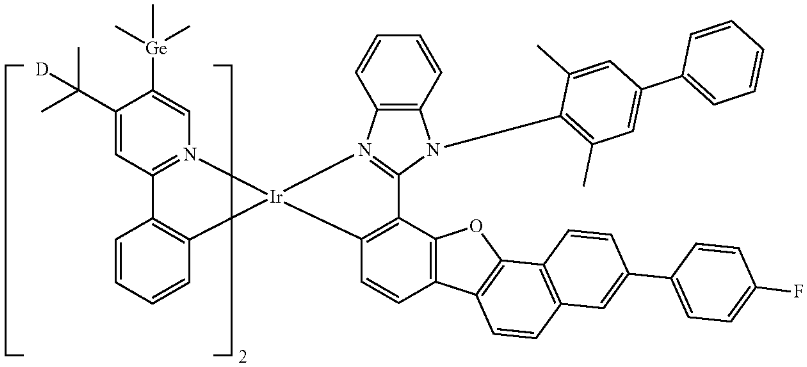
2756
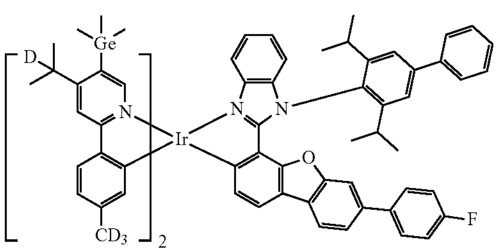
2757
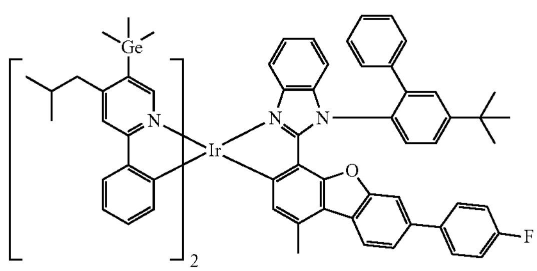
2758
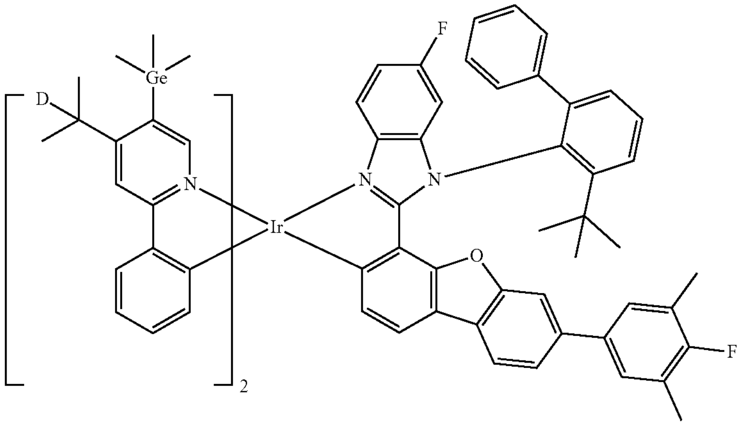

-continued
2759
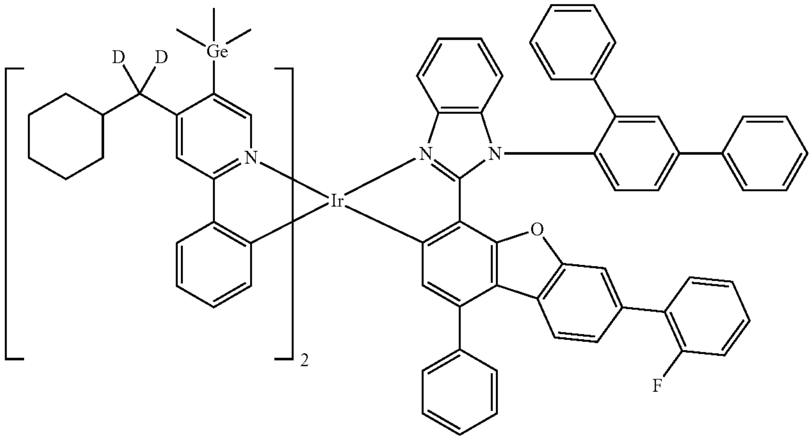
2760
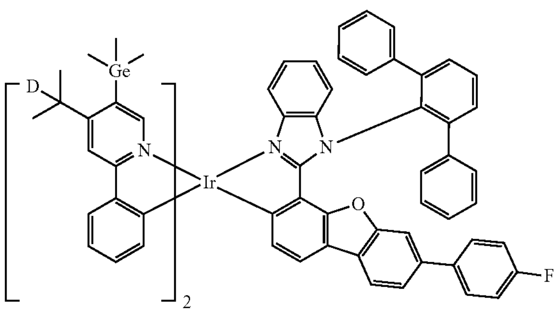
2761
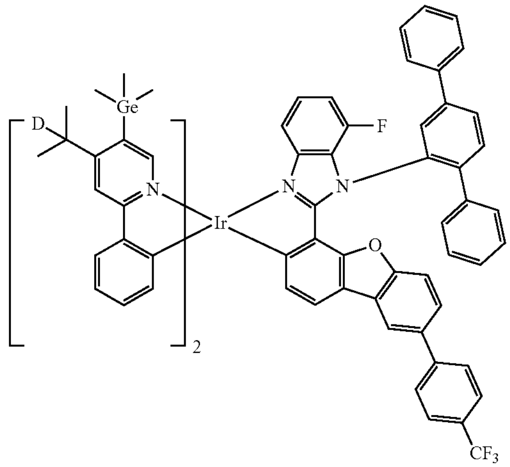
2762
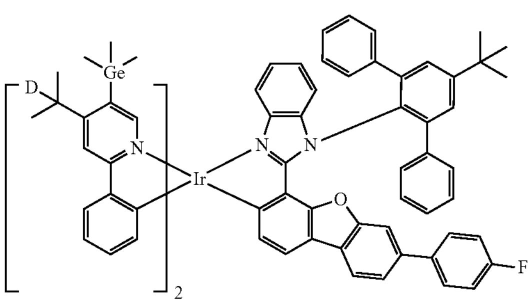
2763
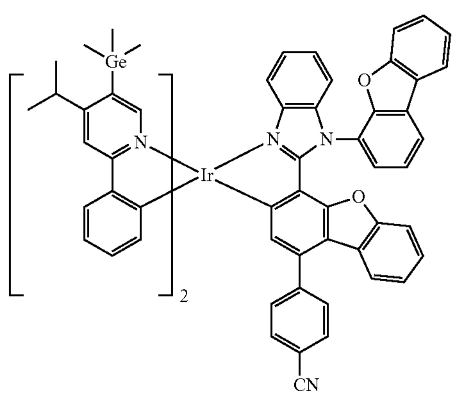

-continued
2764
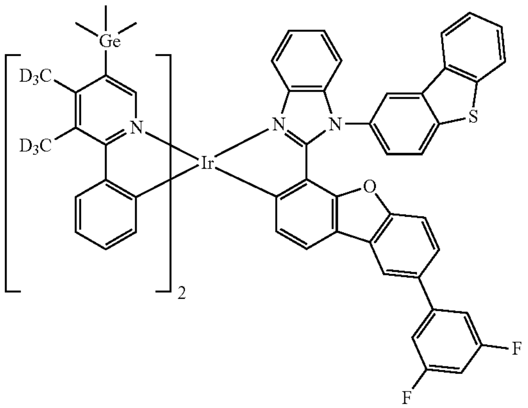
2765
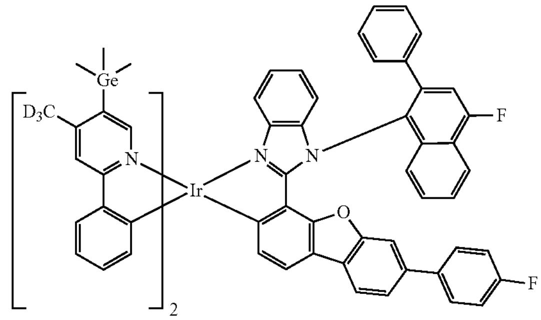
2766
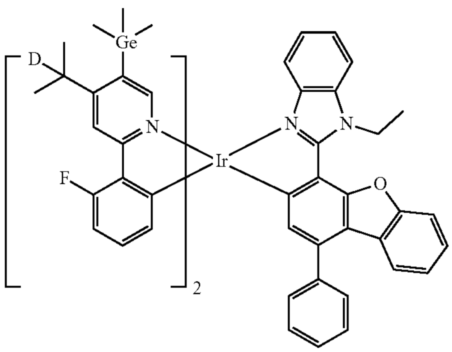
2767
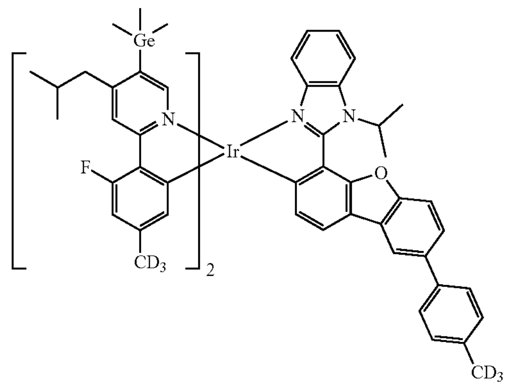
2768
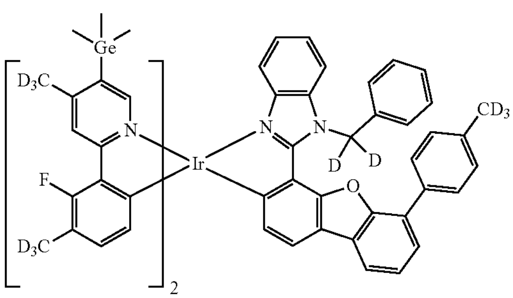
2769
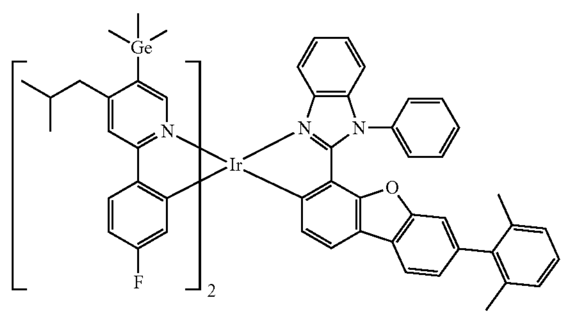
2770
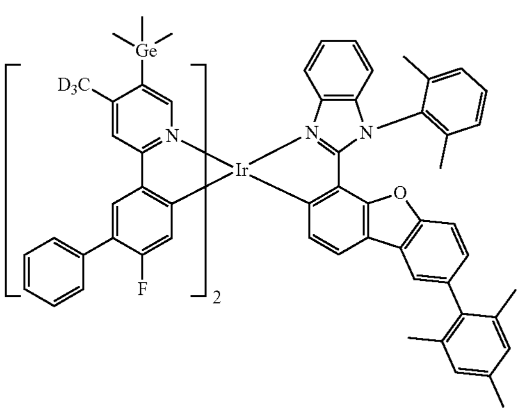
2771
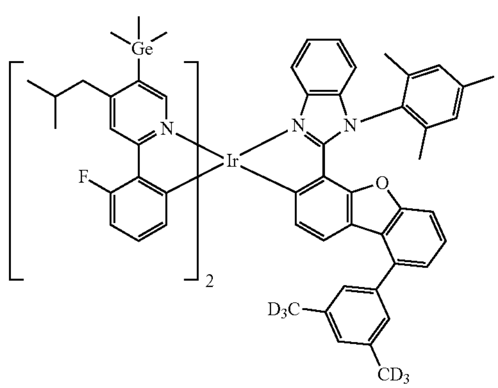

-continued
2772
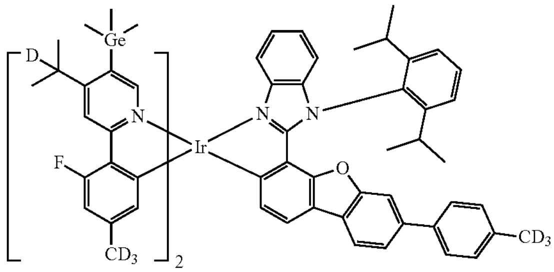
2773
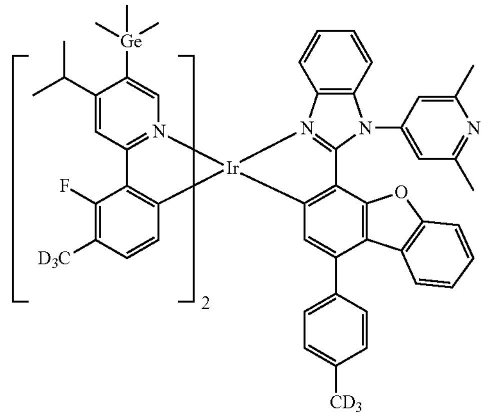
2774
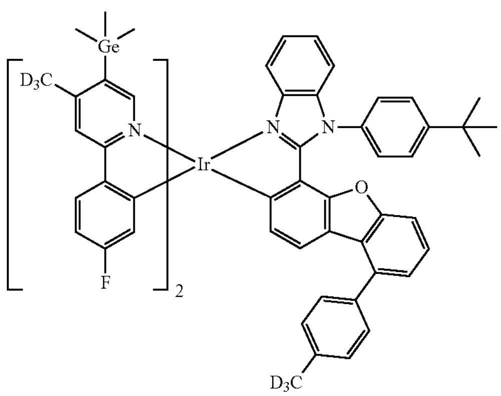
2775
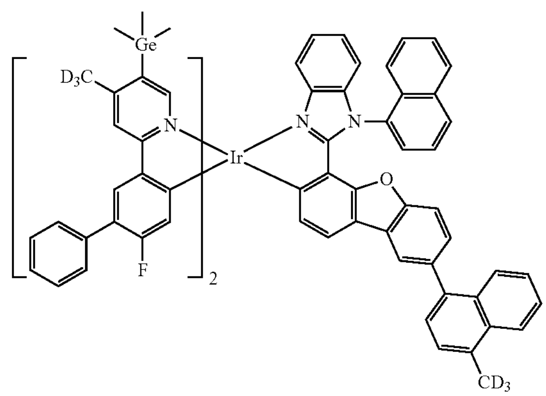
2776
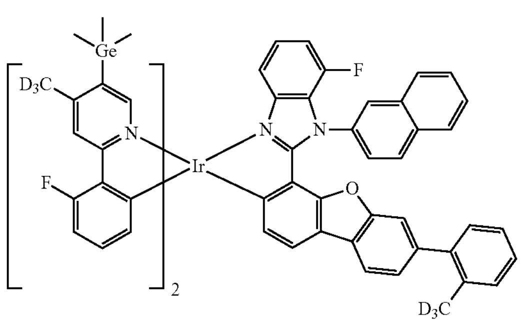
2777
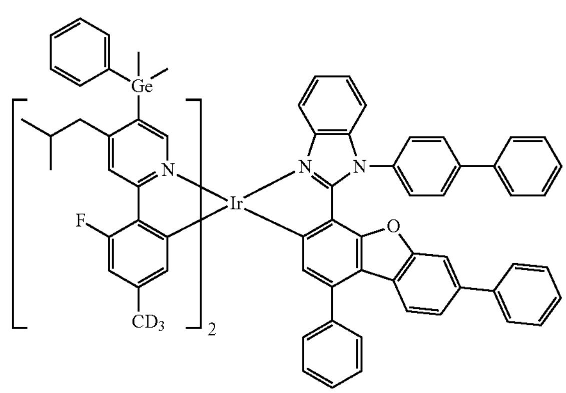

-continued
2778
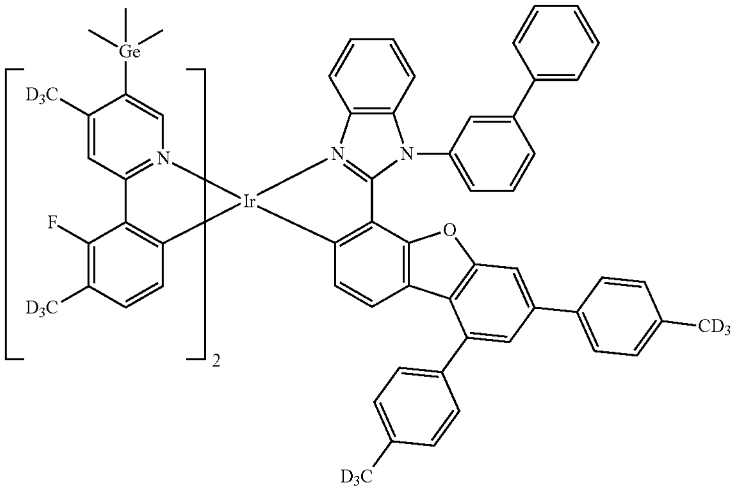
2779
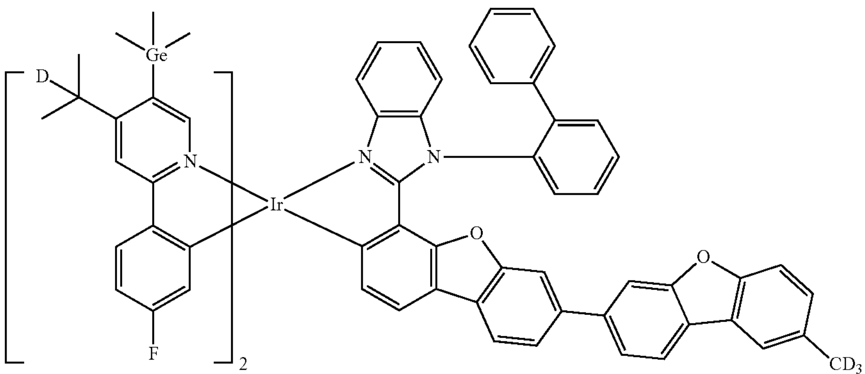
2780
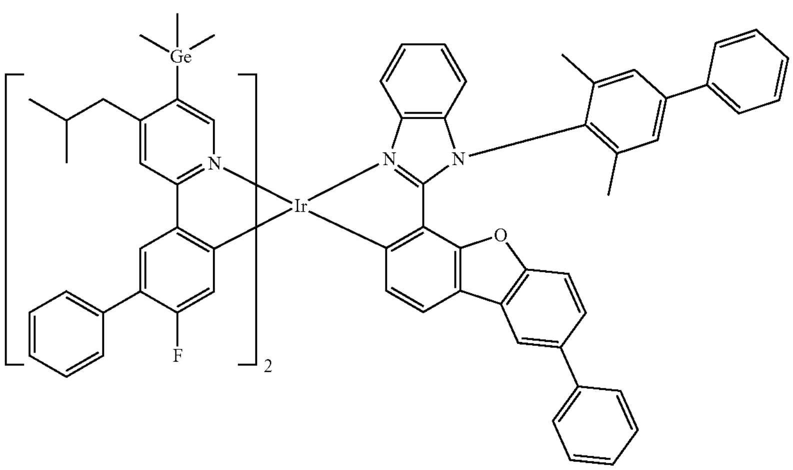
2781
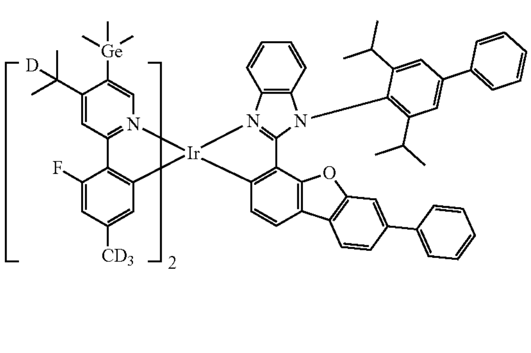
2782
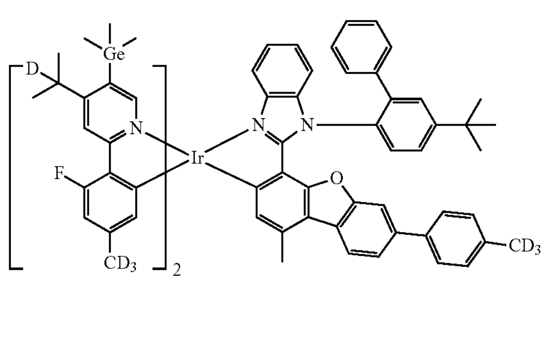

-continued
2783
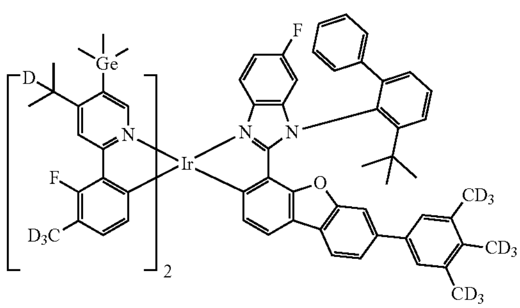
2784
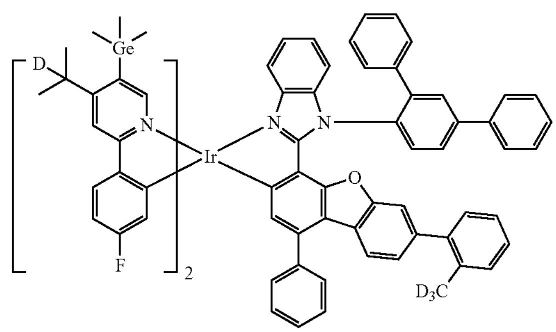
2785
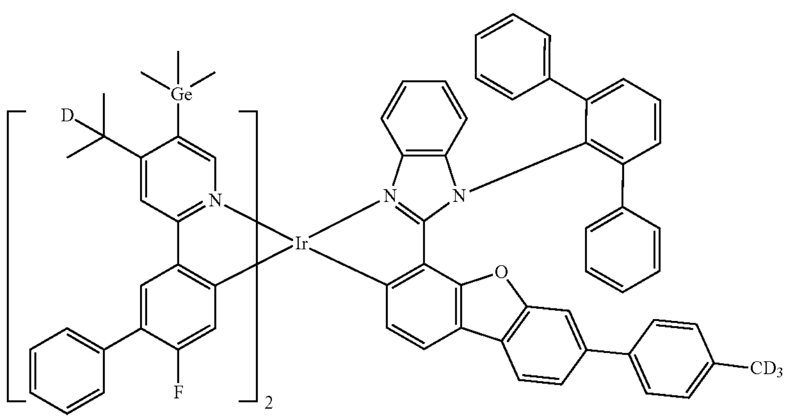
2786
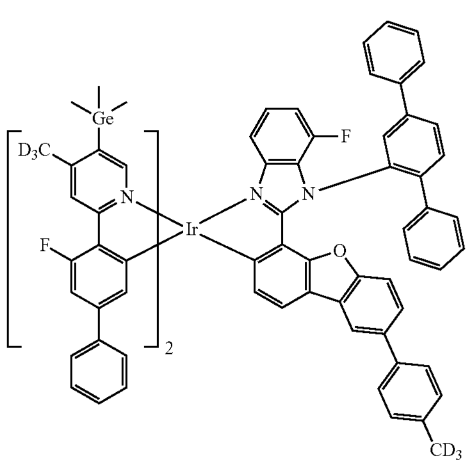
2787
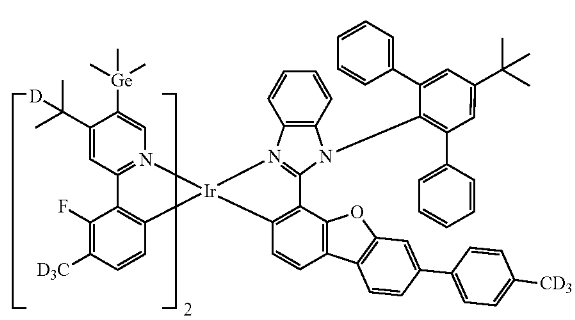

-continued
2788
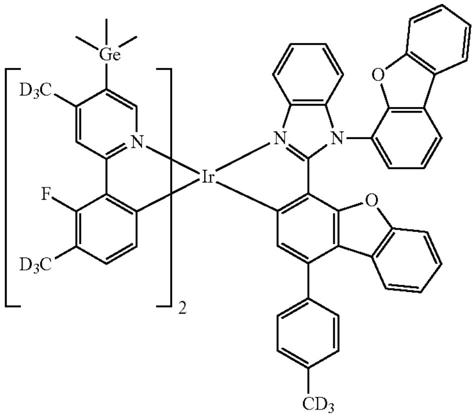
2789
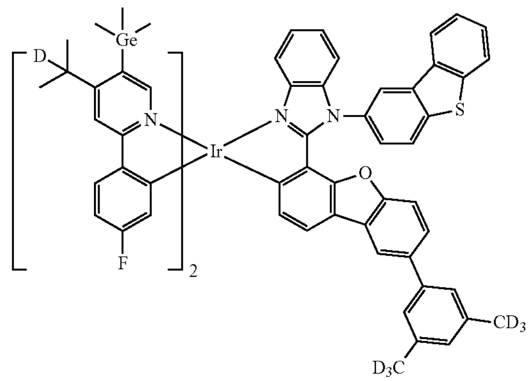
2790
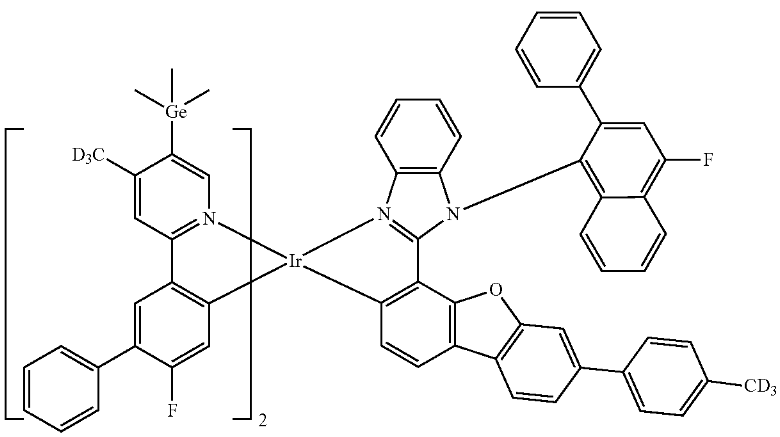
2791
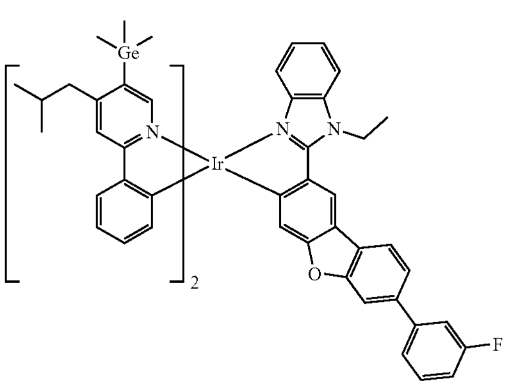
2792
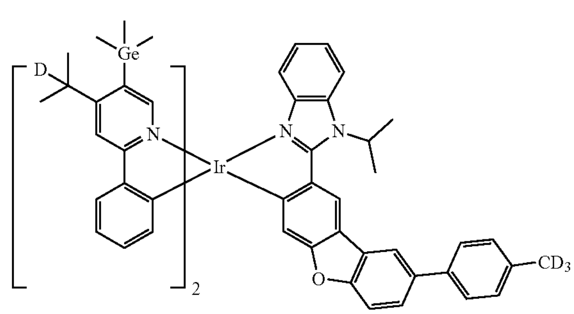

-continued
2793
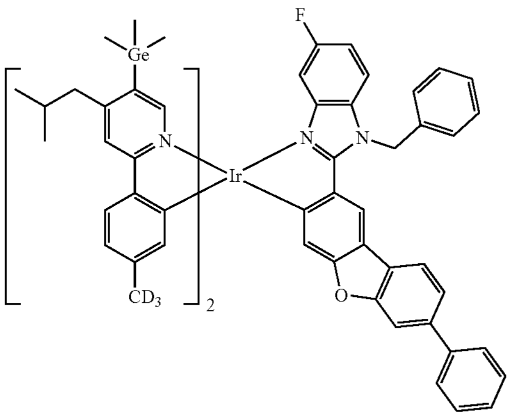
2794
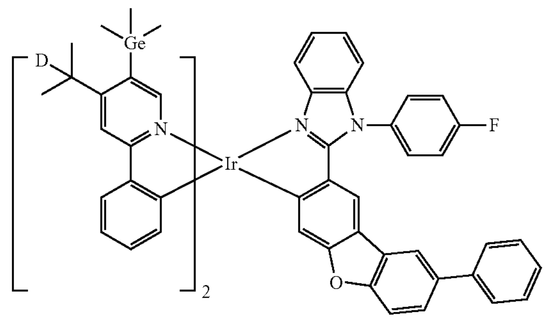
2795
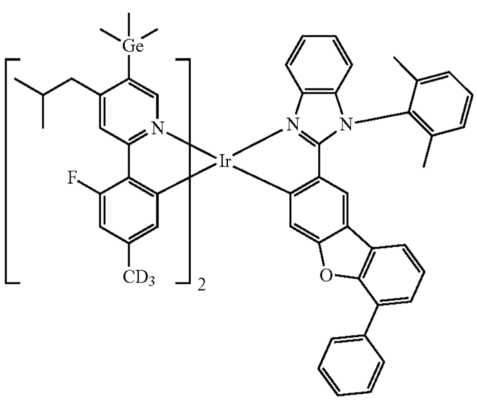
2796
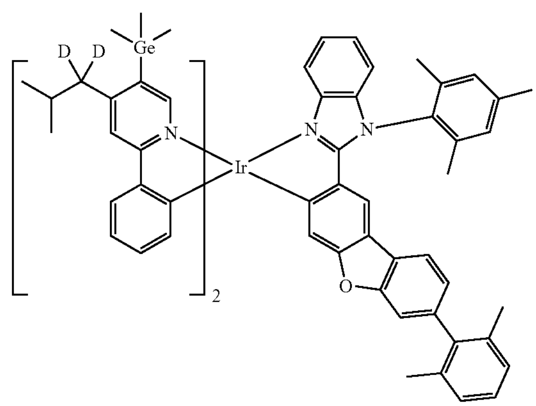
2797
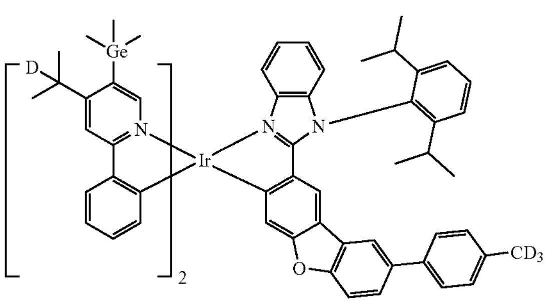
2798
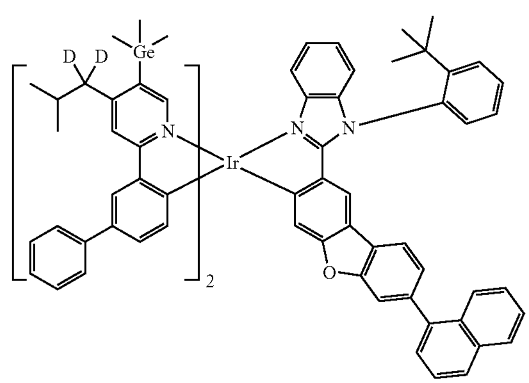
2799
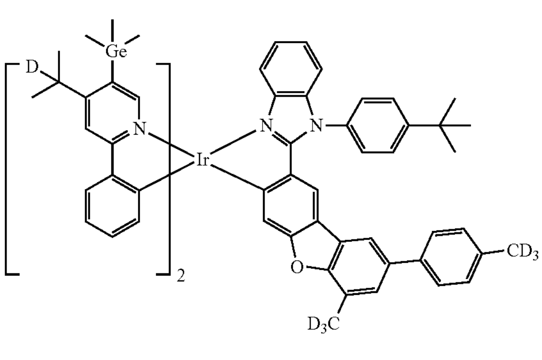
2800
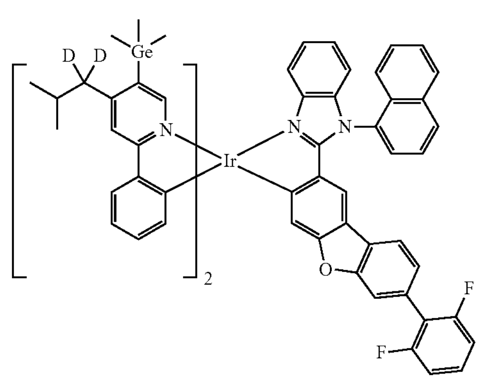

-continued
2801
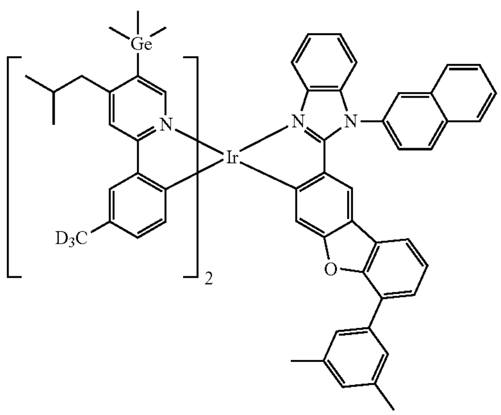
2802
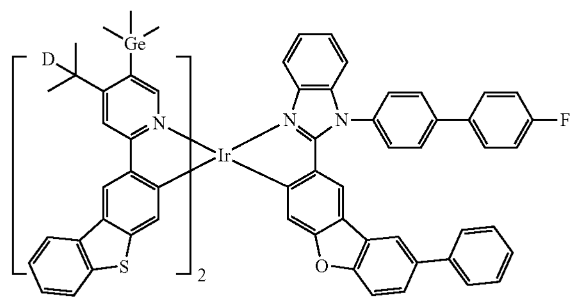
2803
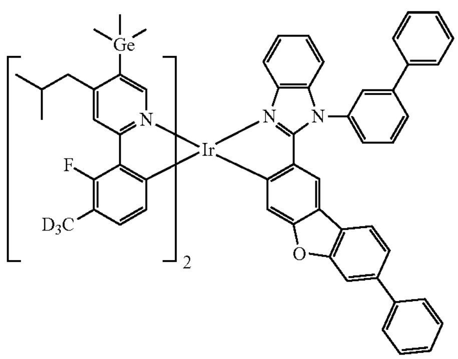
2804
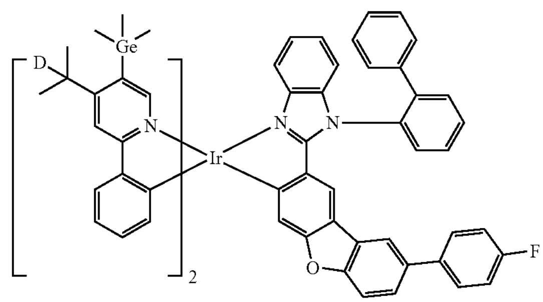
2805
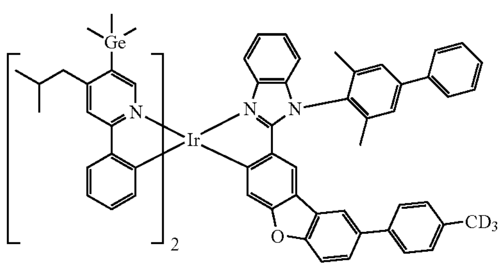
2806
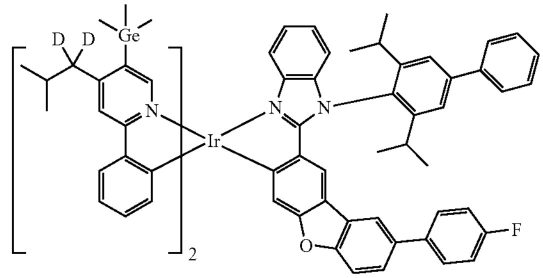
2807
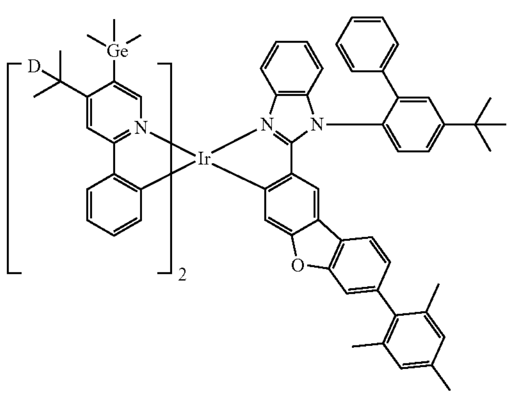
2808
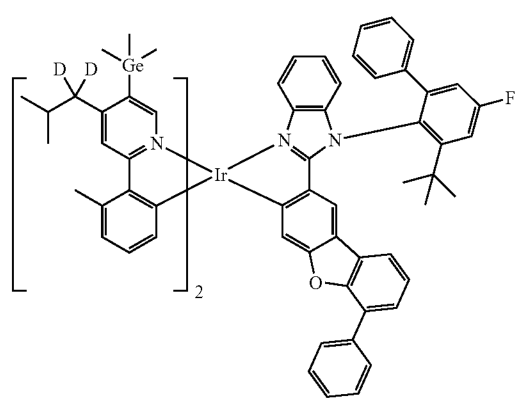

-continued
2809
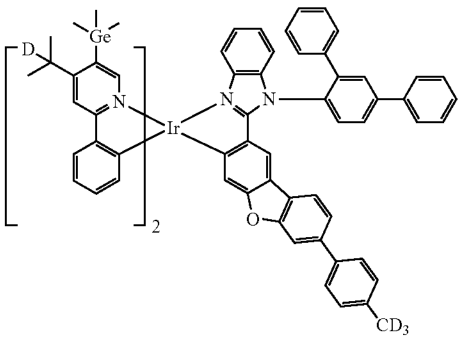
2810
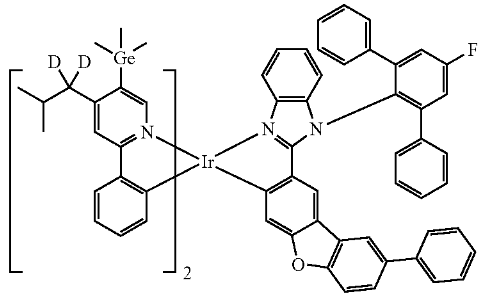
2811
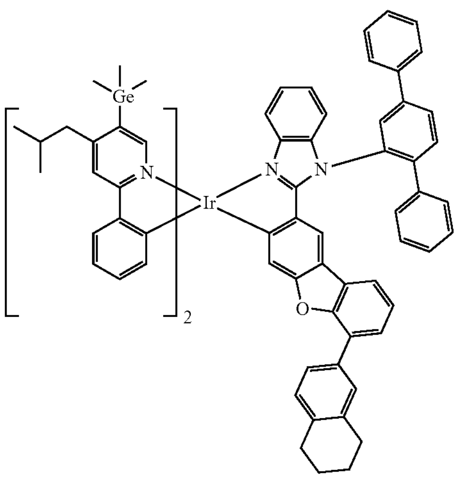
2812
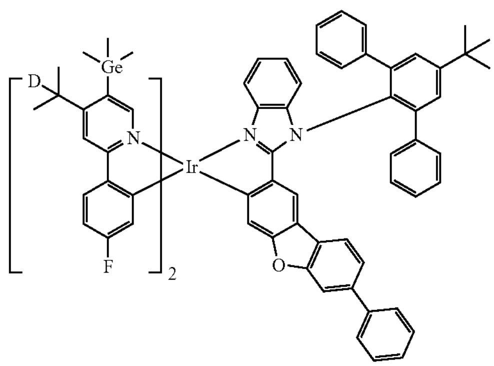
2813
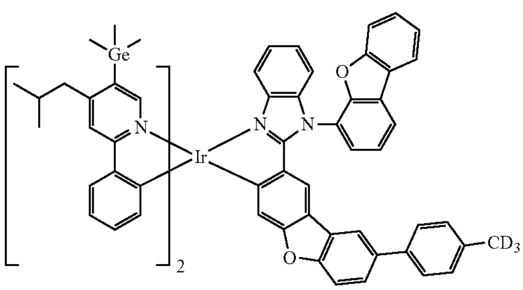
2814
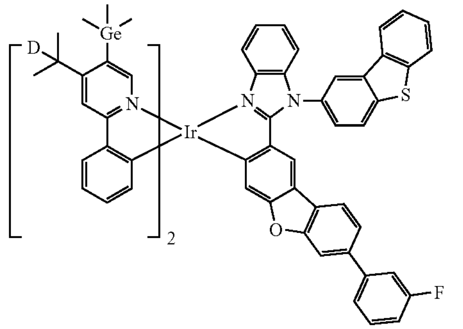
2815
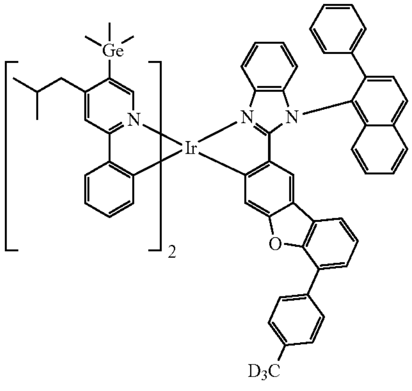
2816
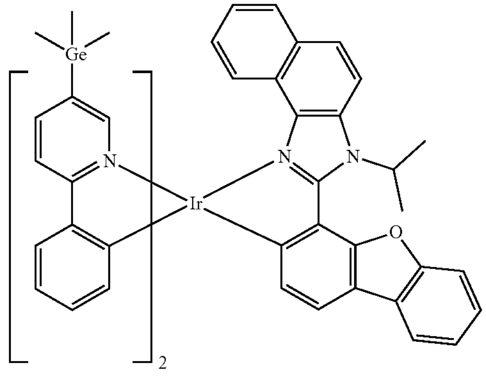

-continued
2817
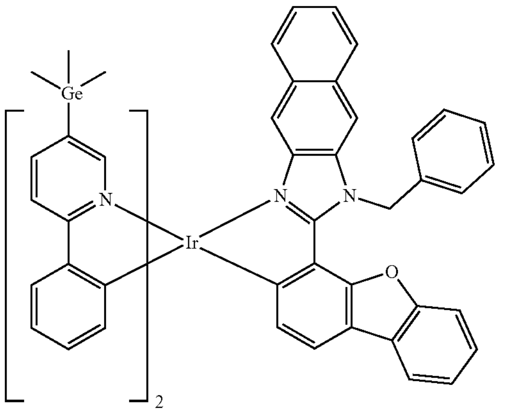
2818
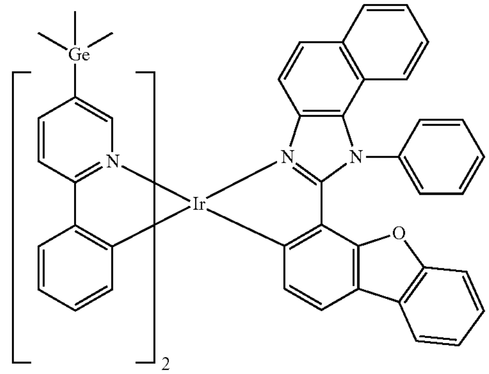
2819
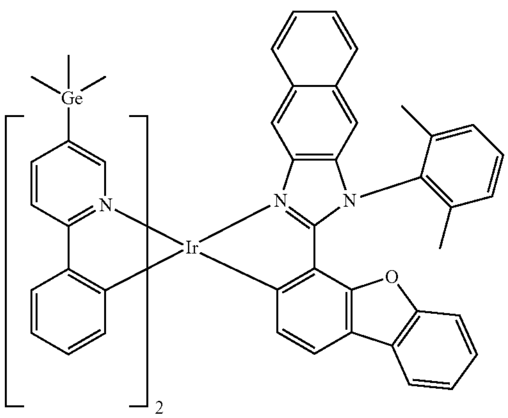
2820
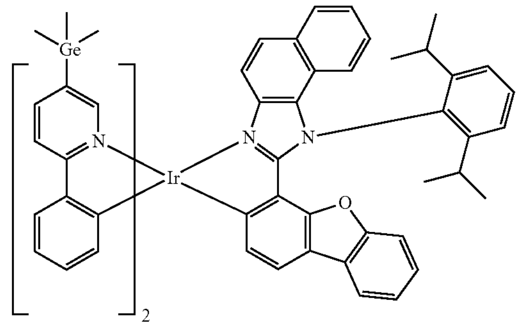
2821
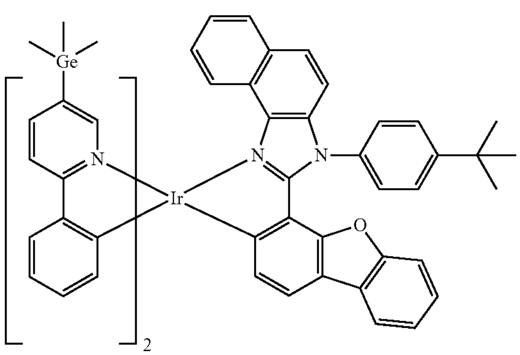
2822
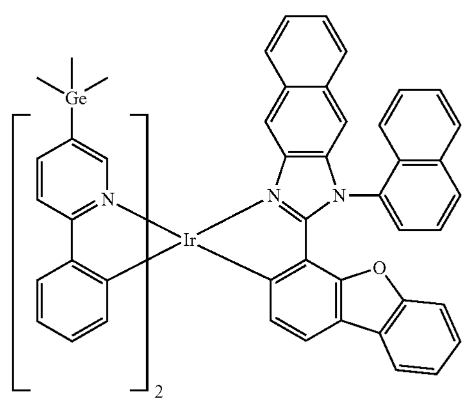

-continued
2823
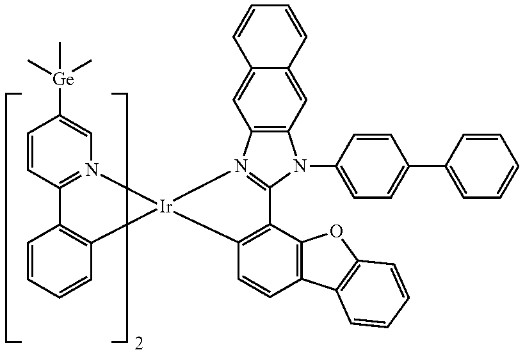
2824
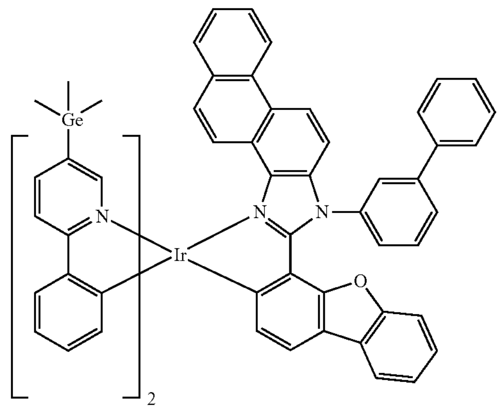
2825
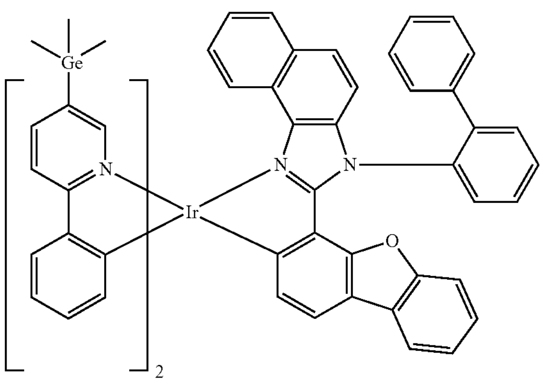
2826
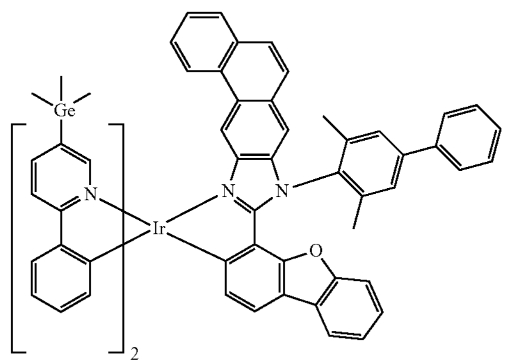
2827
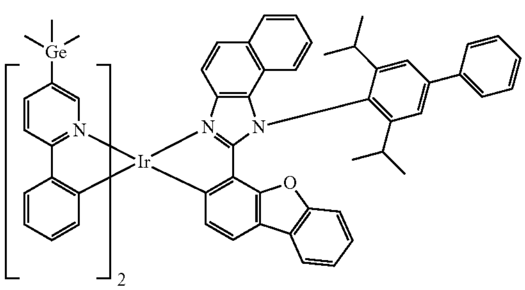
2828
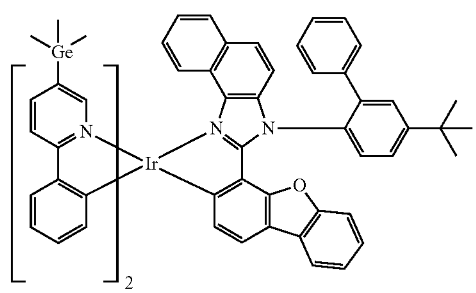
2829
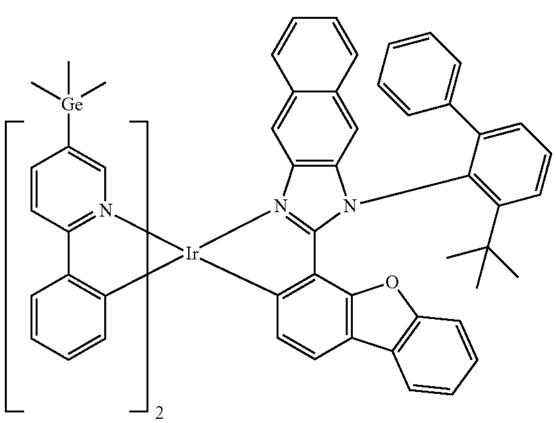
2830
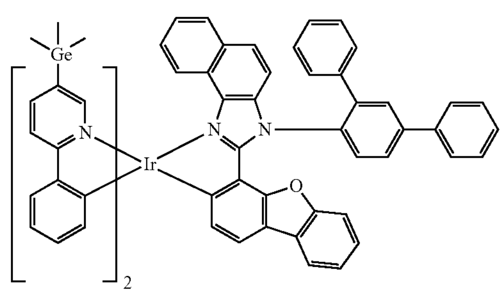

-continued
2831
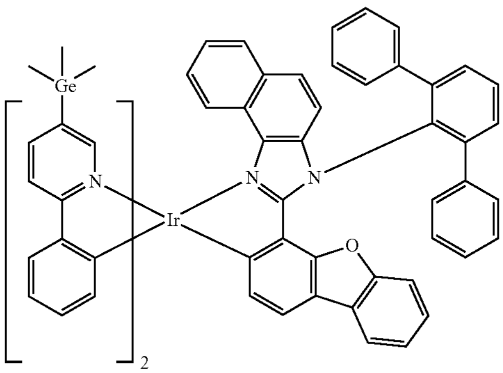
2832
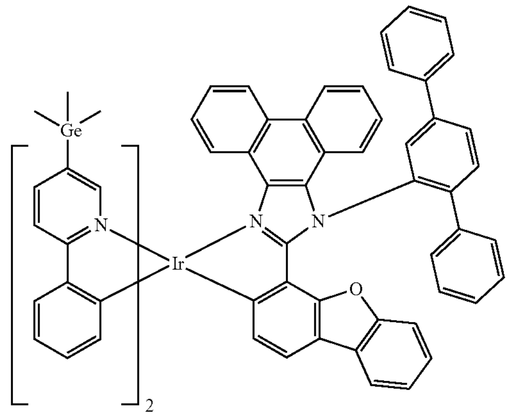
2833
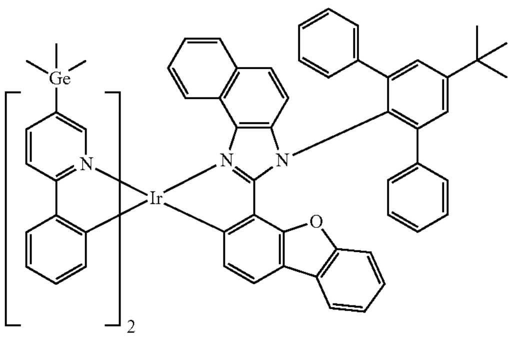
2834
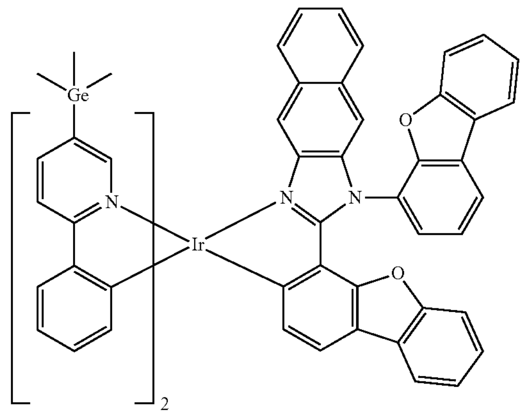
2835
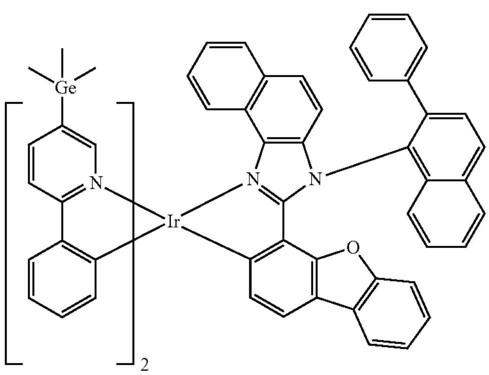
2836
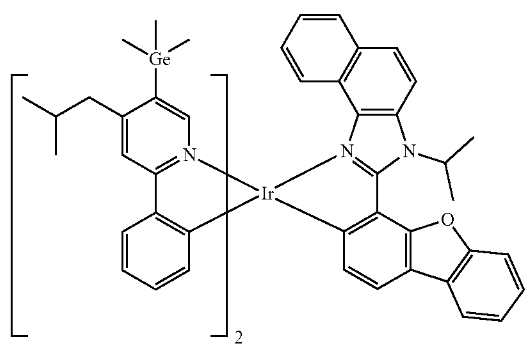
2837
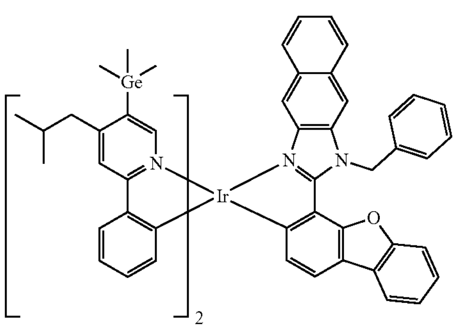
2838
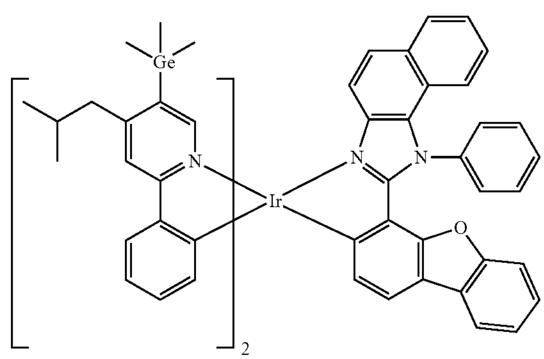

-continued
2839
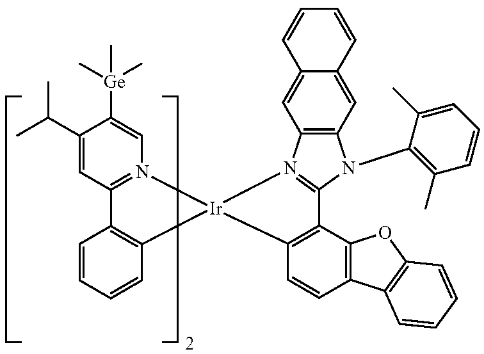
2840
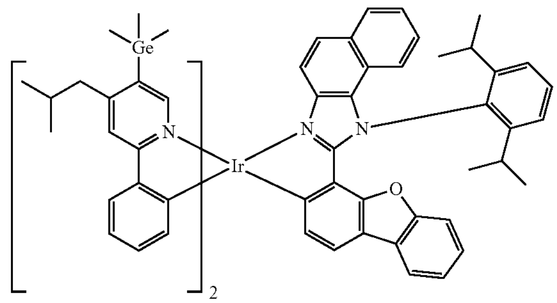
2841
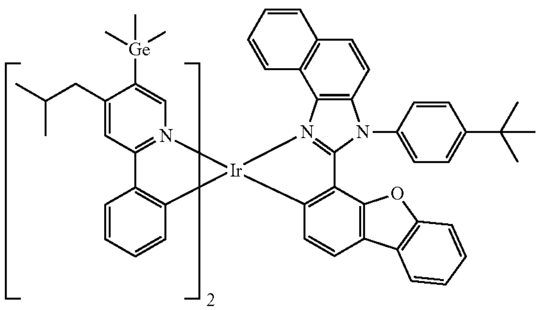
2842
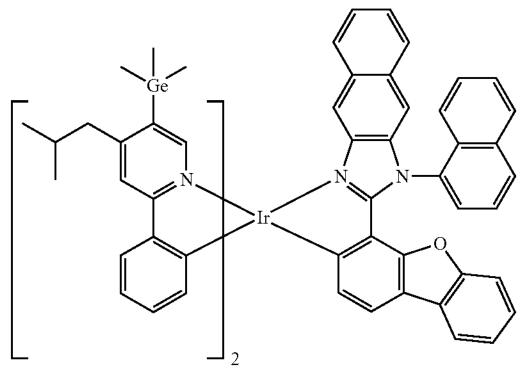
2843
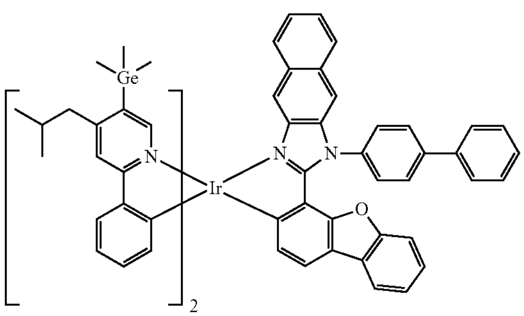
2844
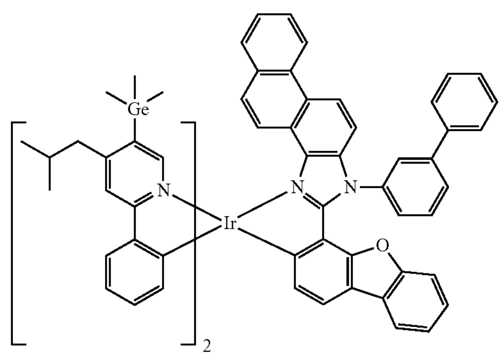
2845
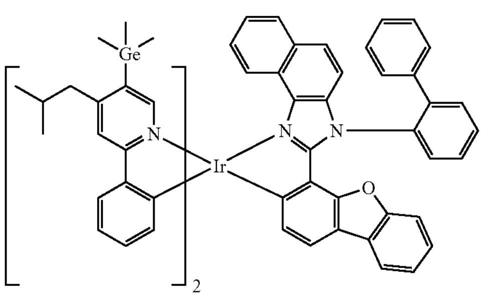
2846
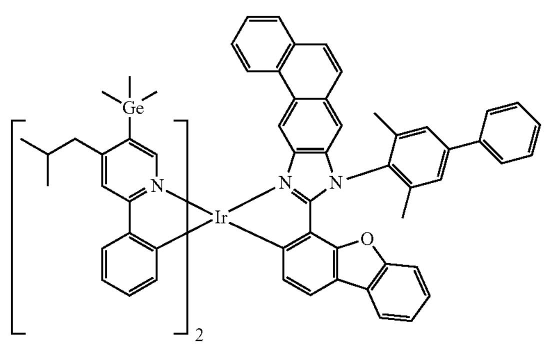

-continued
2847
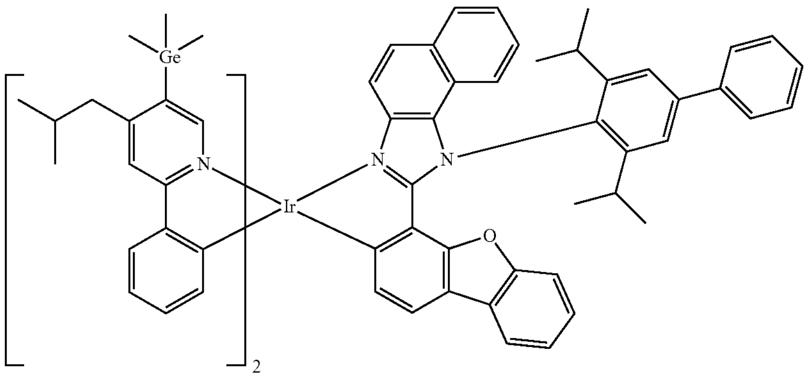
2848
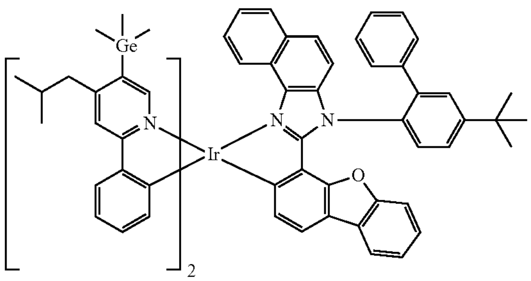
2849
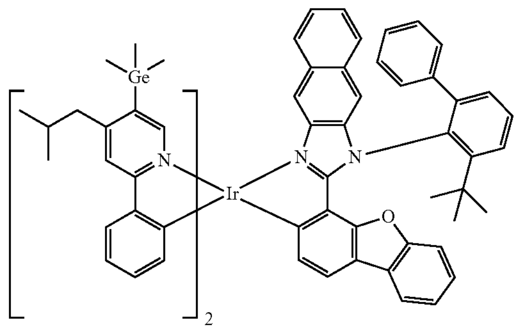
2850
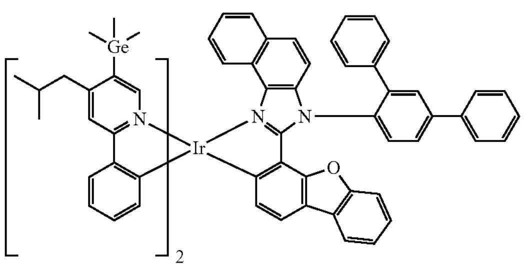
2851
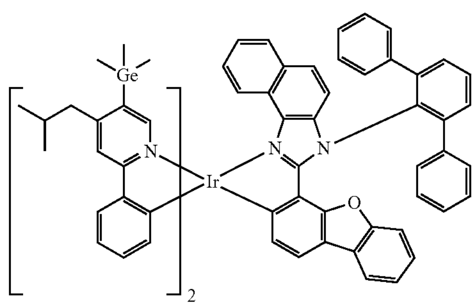
2852
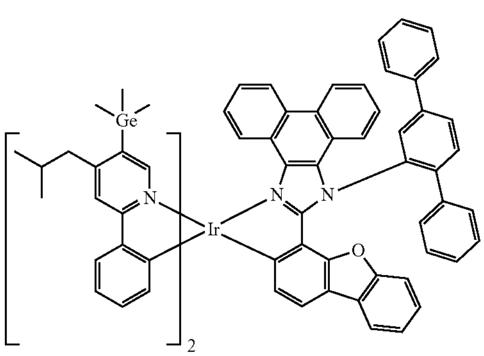
2853
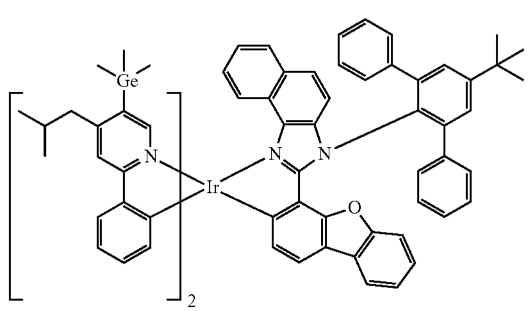

-continued
2854
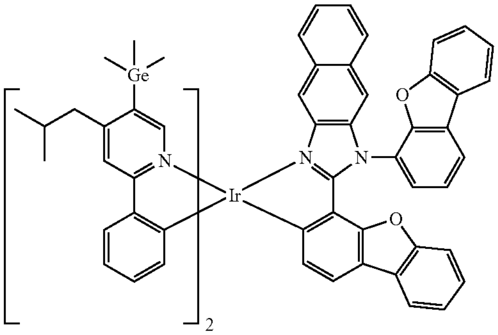
2855
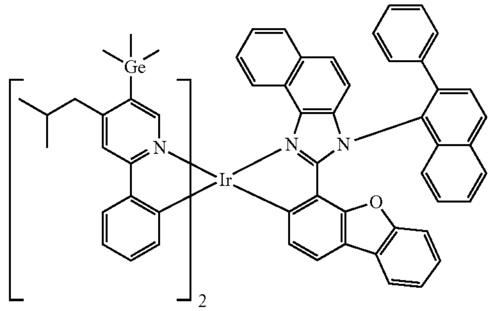
2856
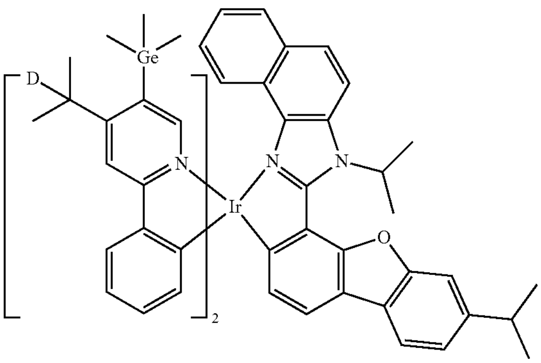
2857
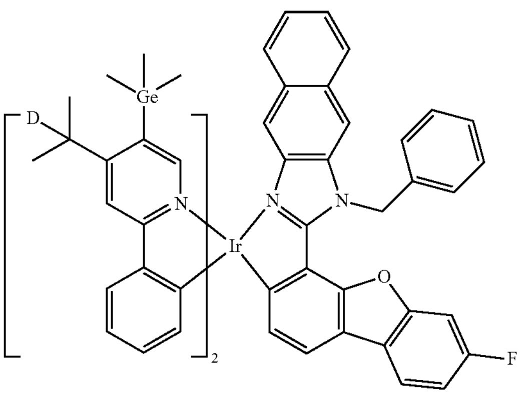
2858
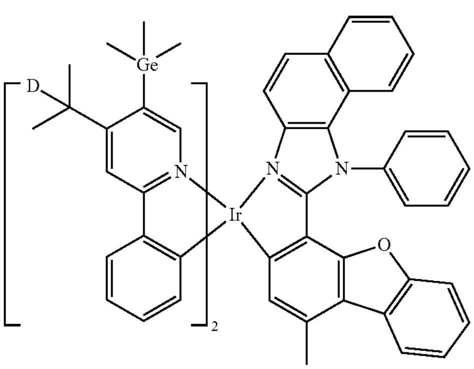
-continued
2859
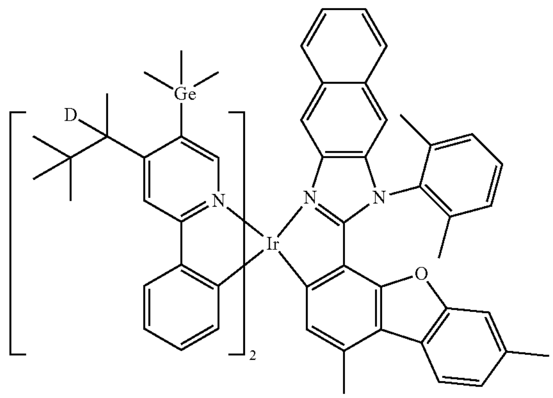
2860
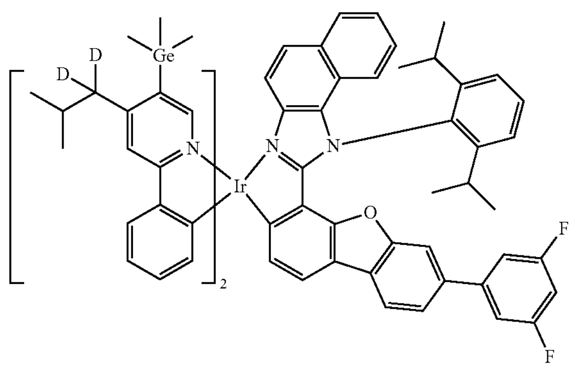
2861
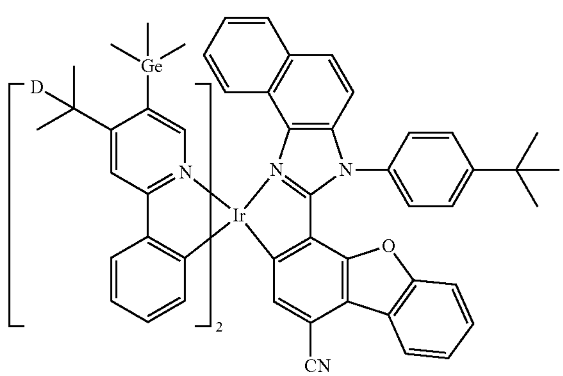

-continued
2862
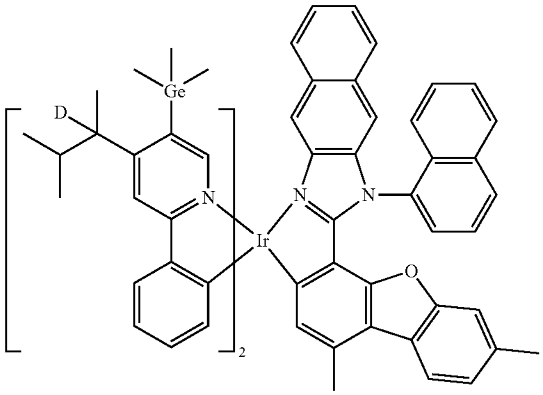
2863
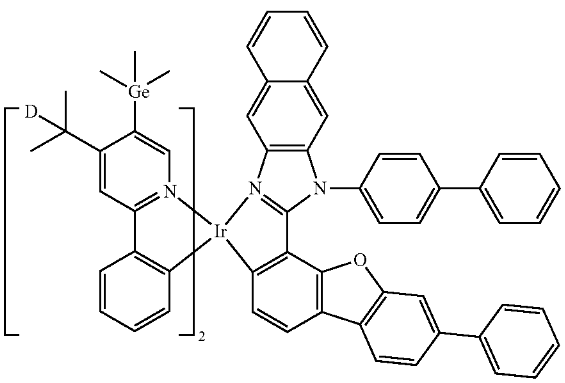
2864
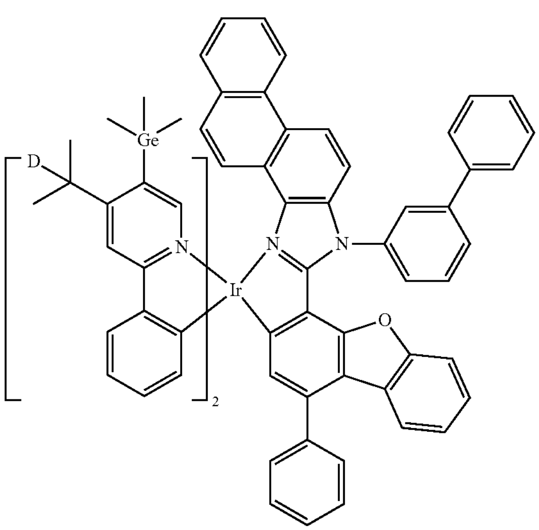
-continued
2865
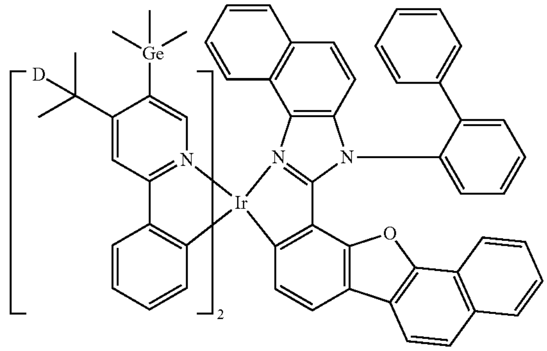
2866
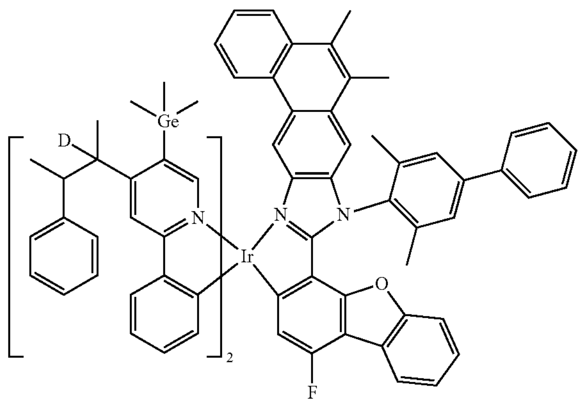
2867
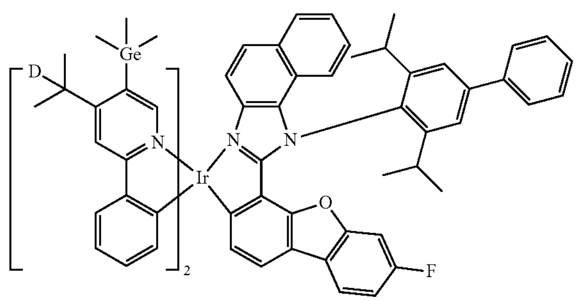
2868
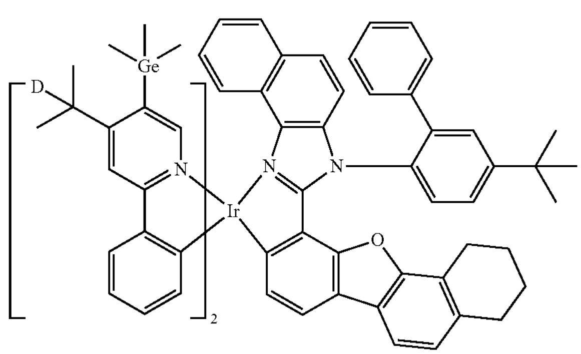

-continued
2869
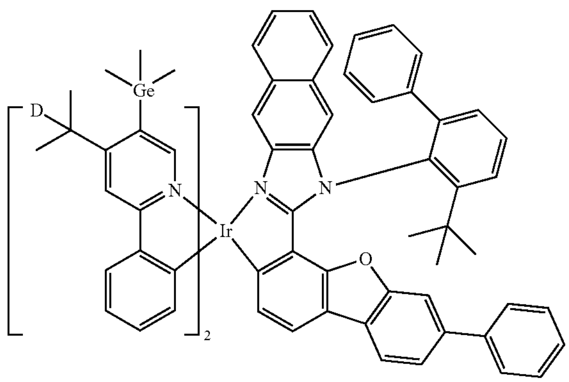
2870
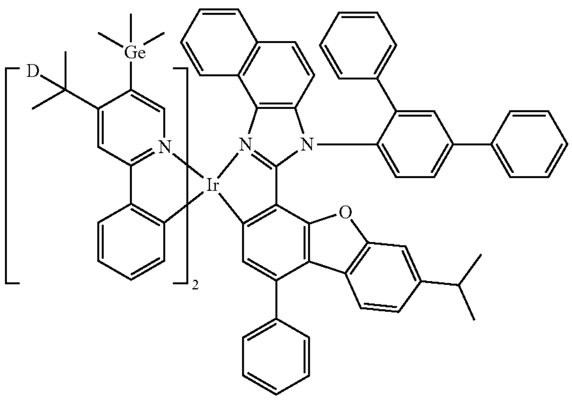
2871
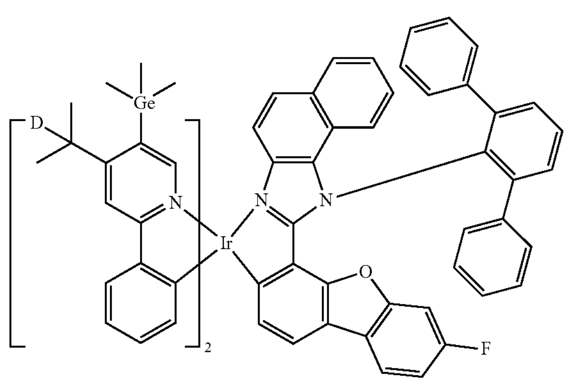
2872
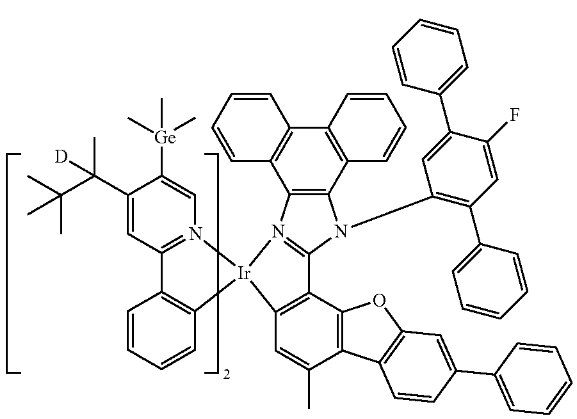
-continued
2873
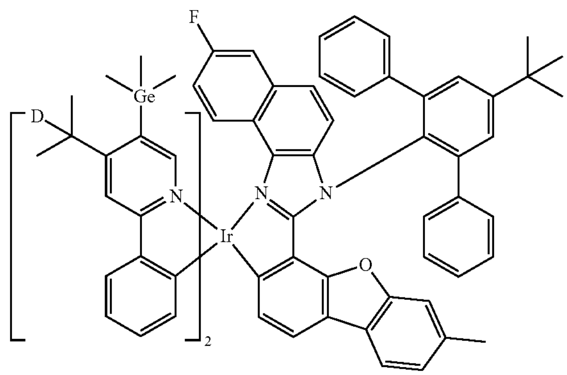
2874
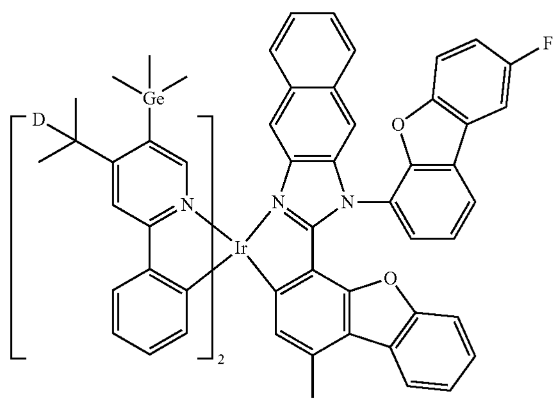
2875
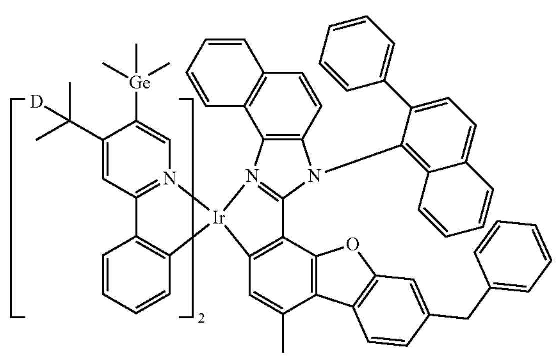
2876
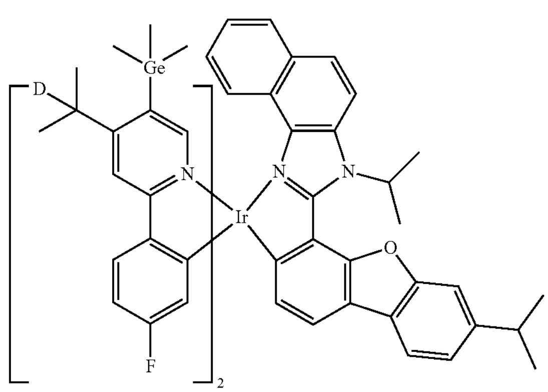

-continued
2877
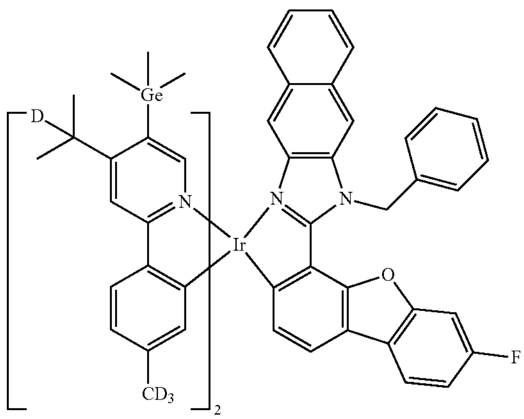
2878
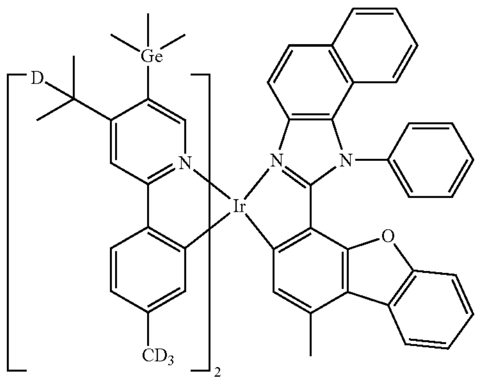
2879
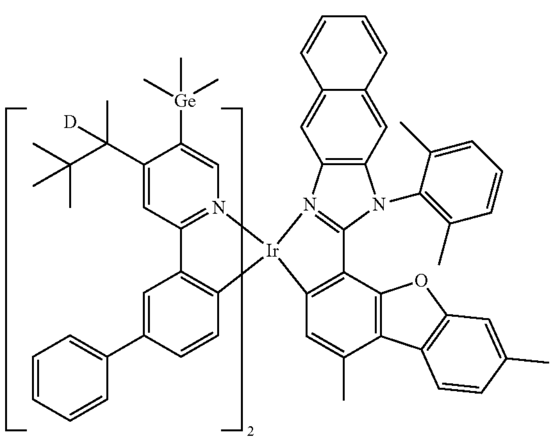
2880
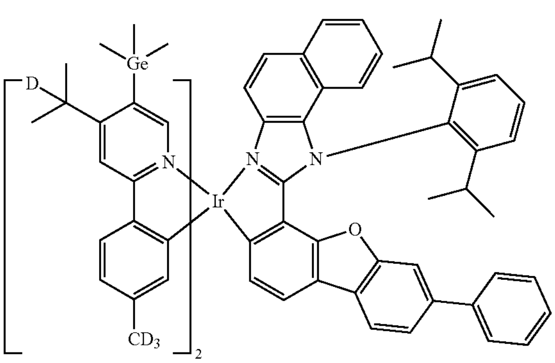
-continued
2881
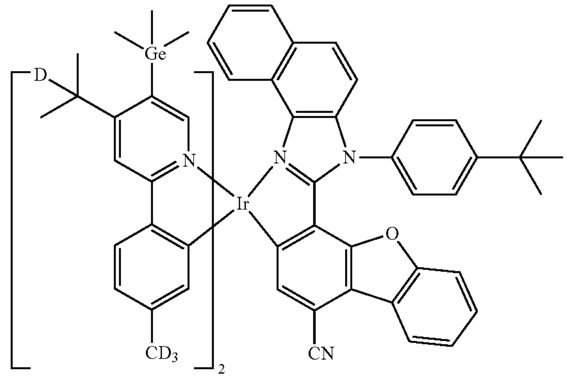
2882
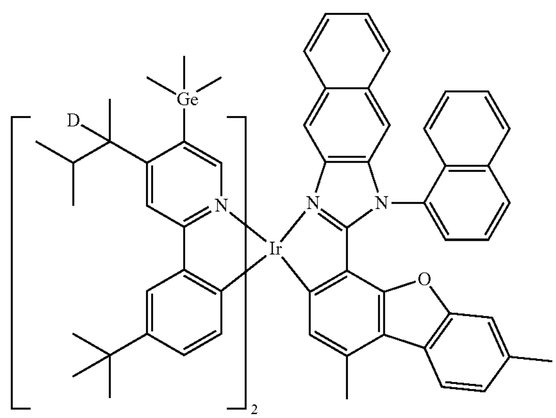
2883
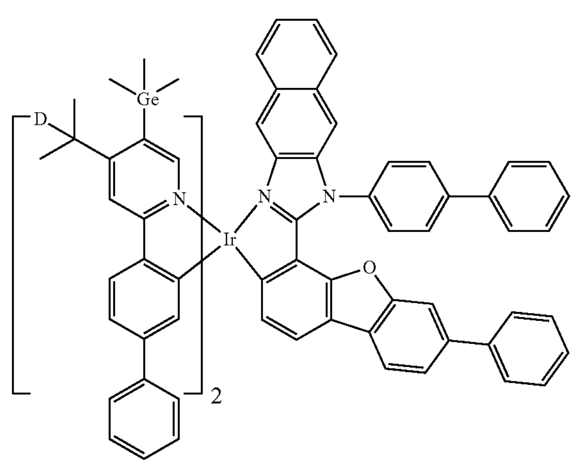

-continued
2884
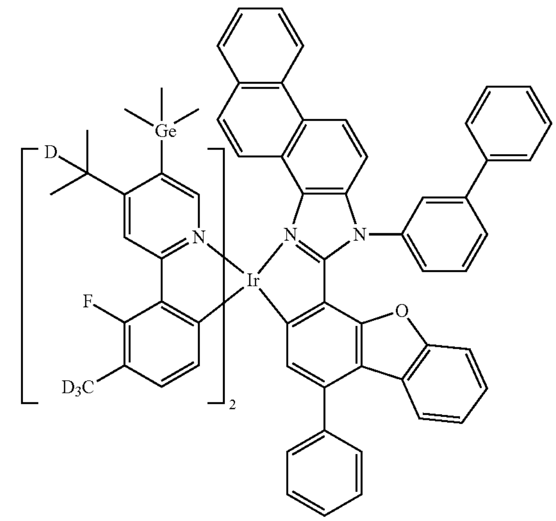
2885
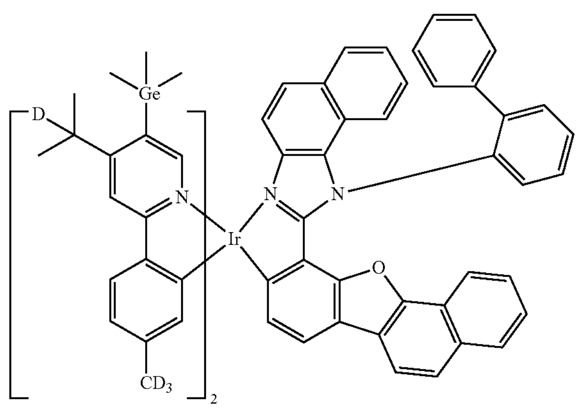
2886
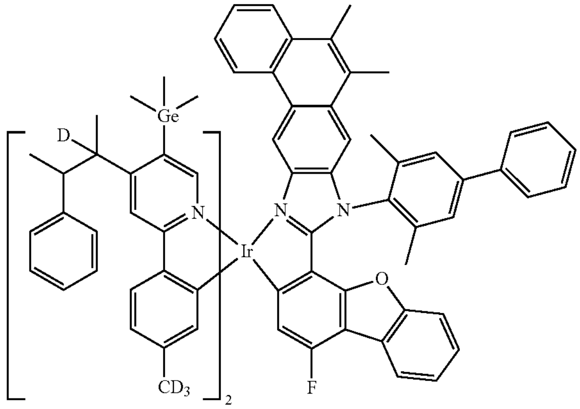
-continued
2887
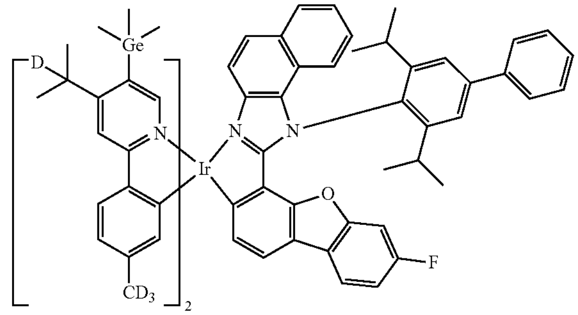
2888
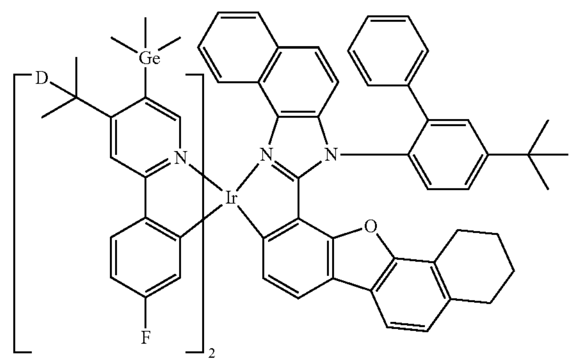
2889
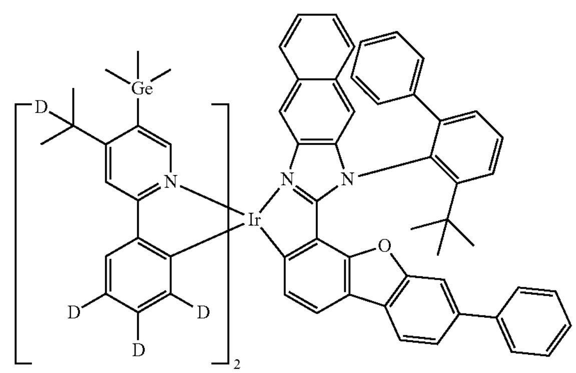
2890
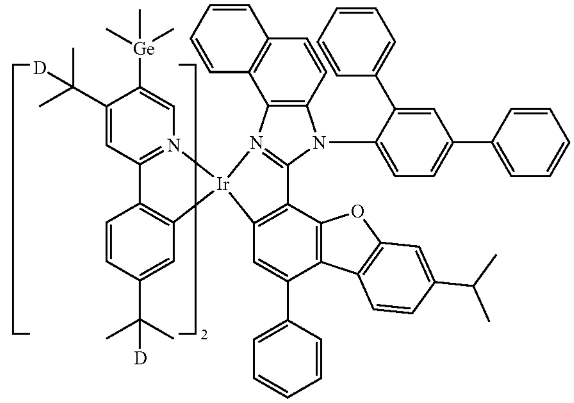

-continued
2891
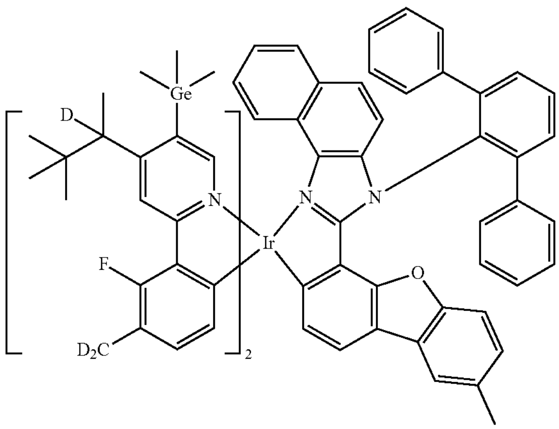
2892
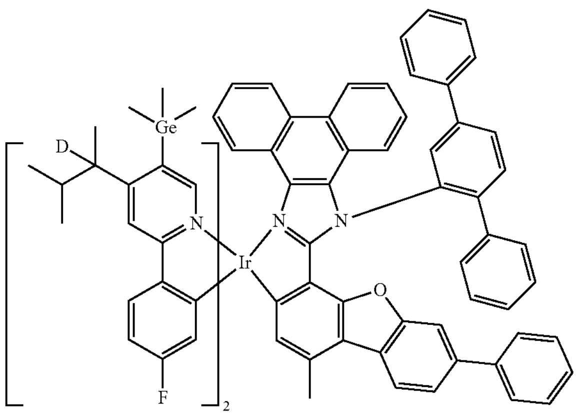
2893
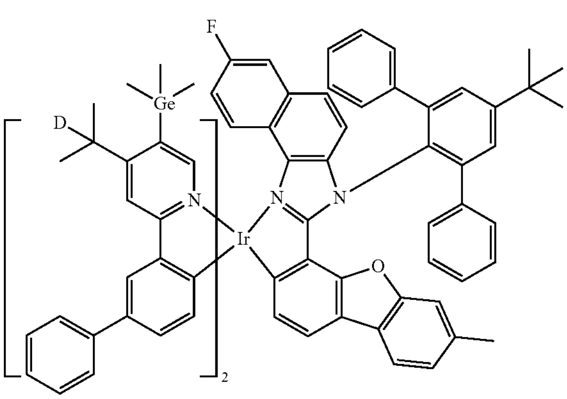
-continued
2894
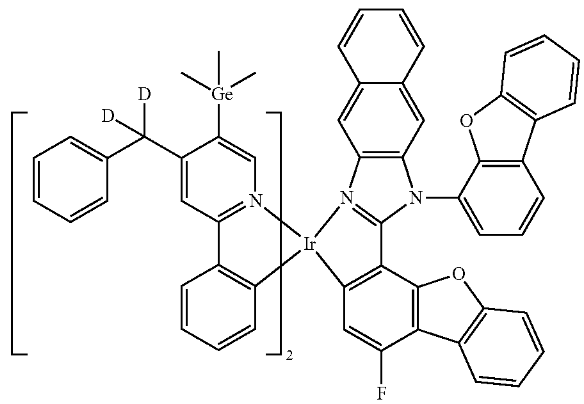
2895
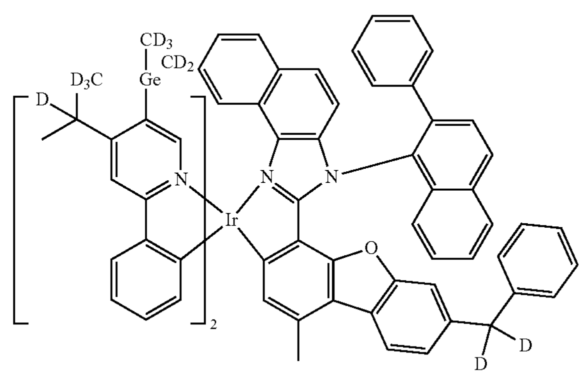
2896
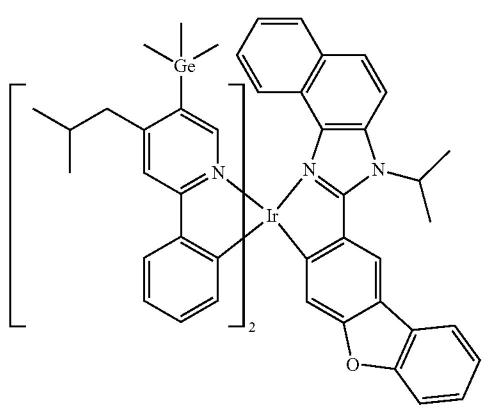

-continued
2897
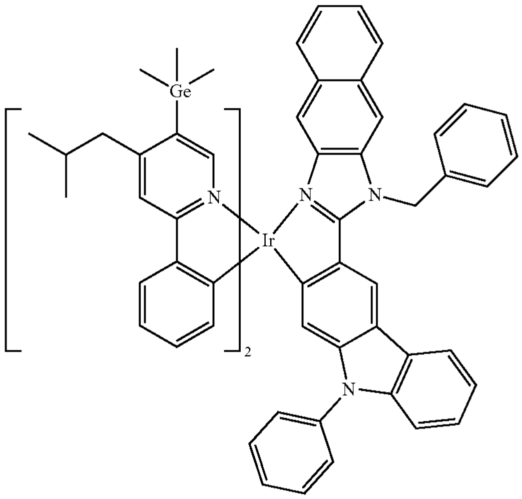
2898
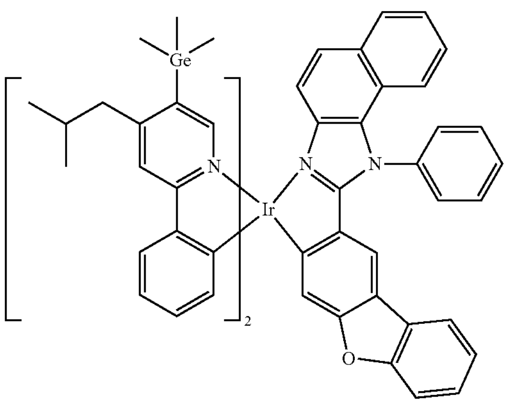
2899
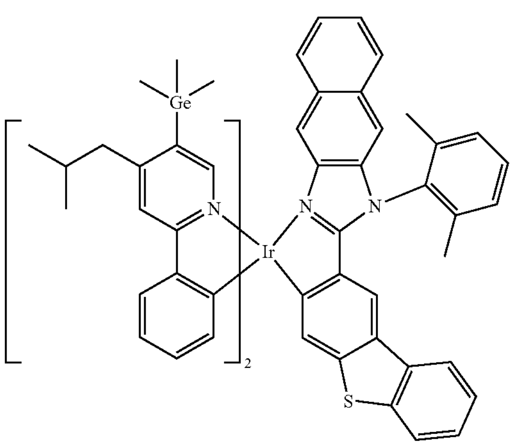
-continued
2900
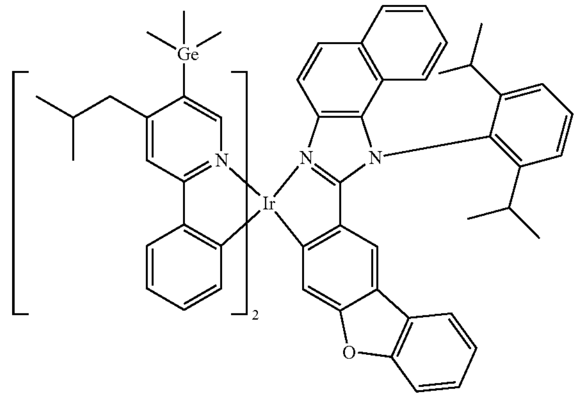
2901
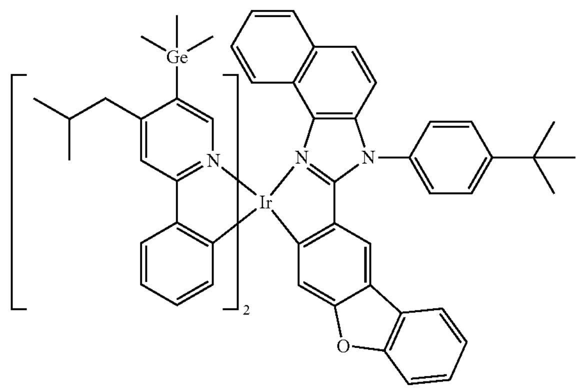
2902
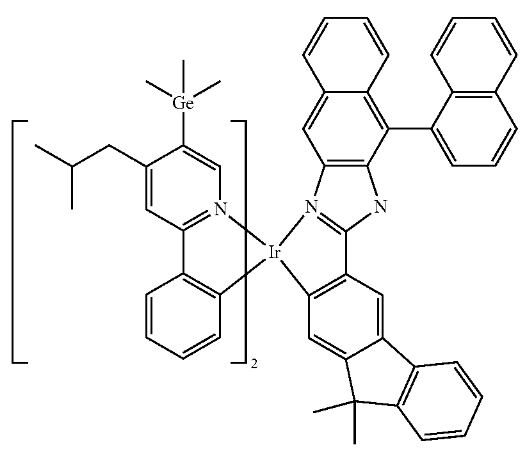

-continued
2903
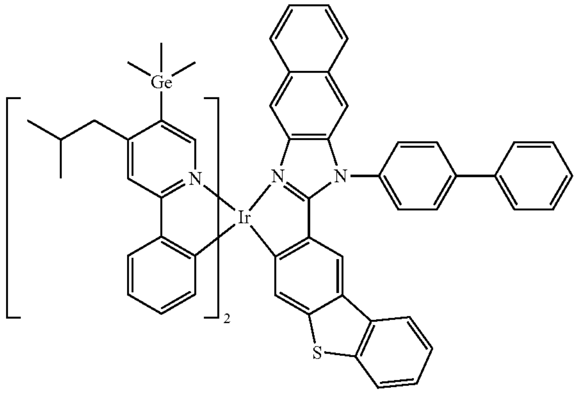
2904
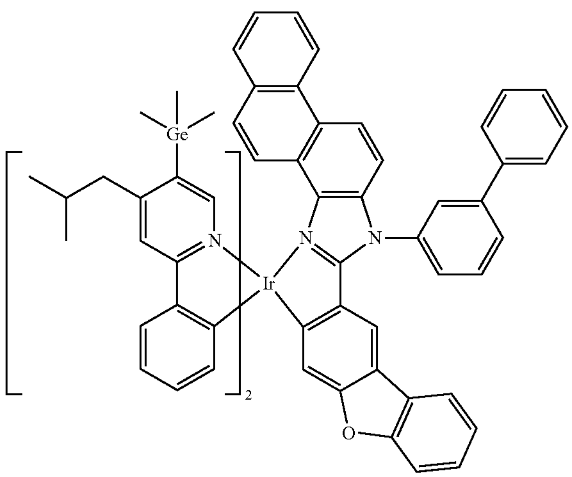
2905
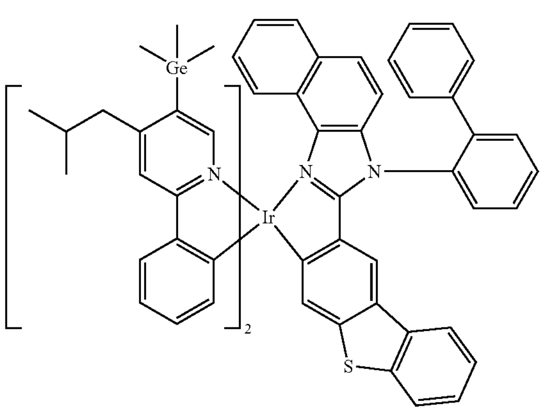
-continued
2906
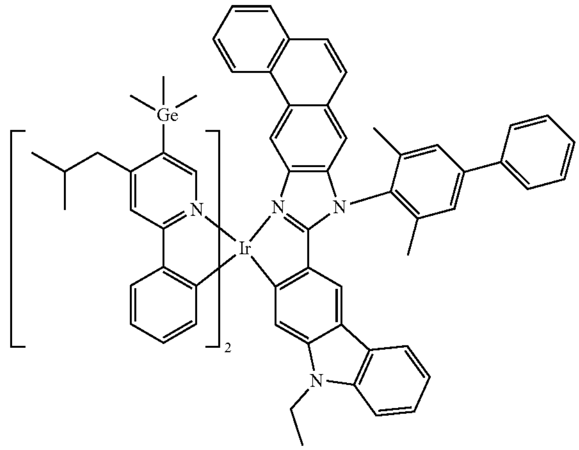
2907
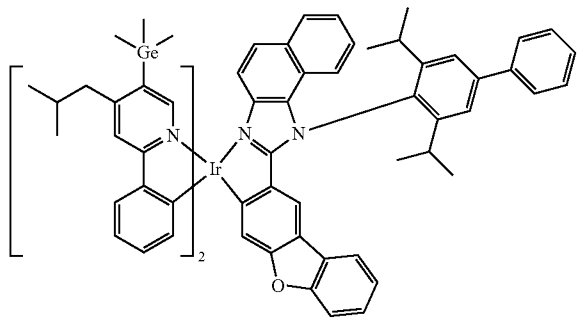
2908
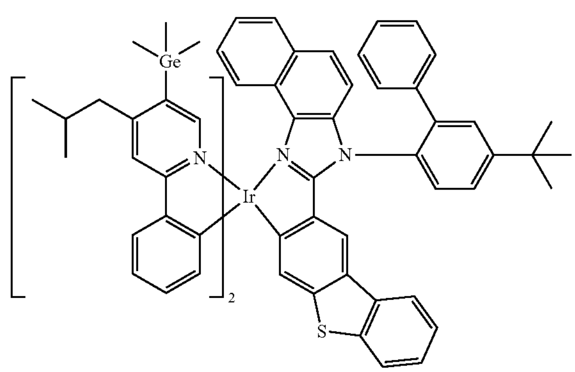

-continued
2909
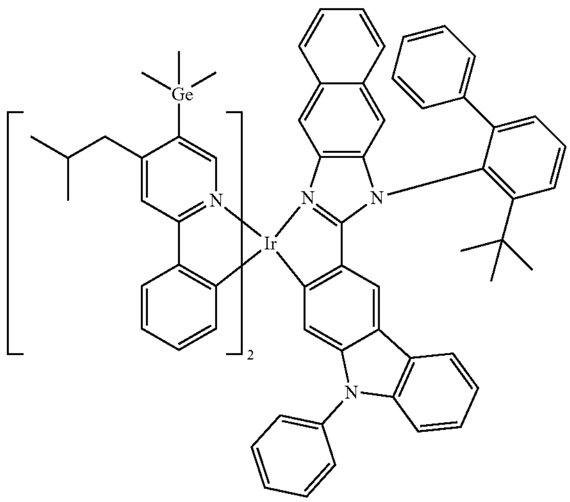
2910
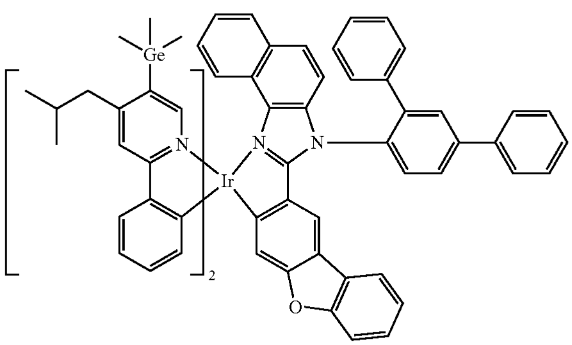
2911
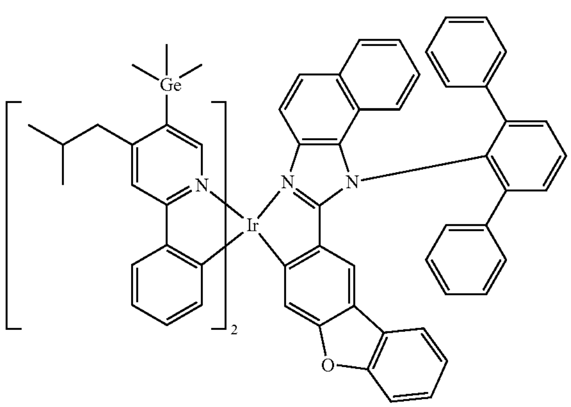
-continued
2912
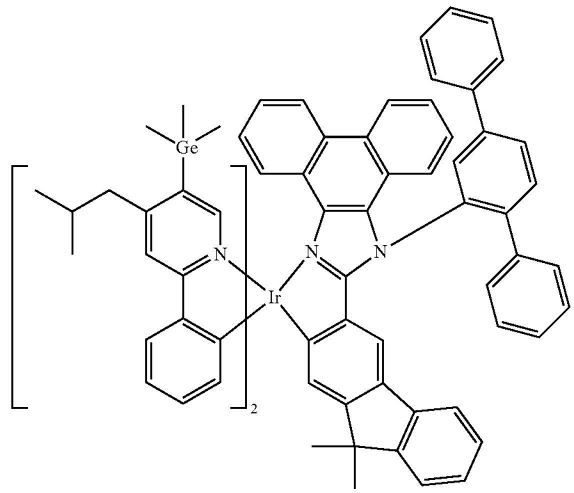
2913
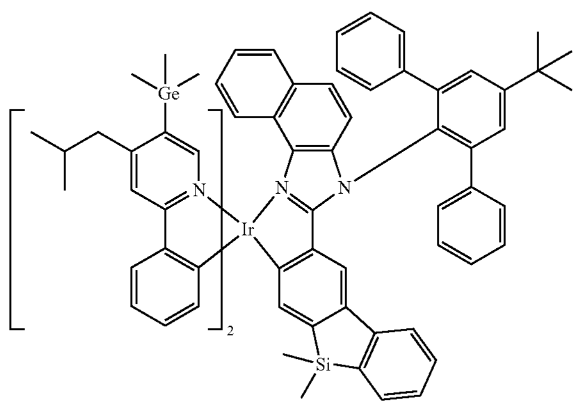
2914
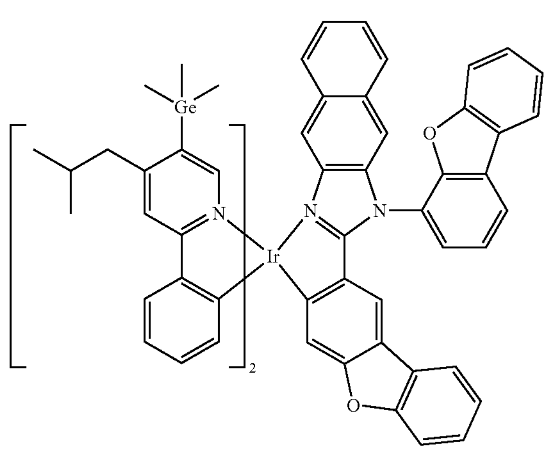

-continued
2915
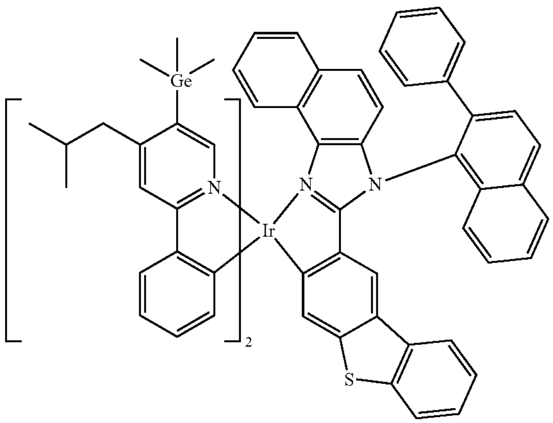
2916
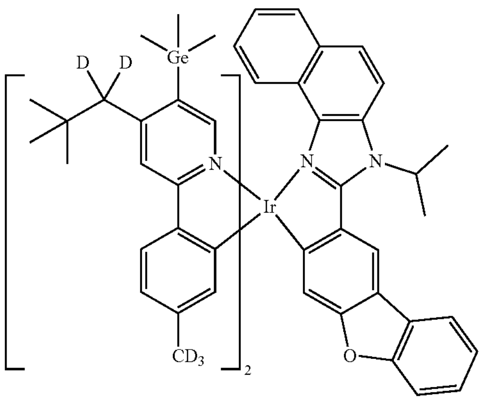
2917
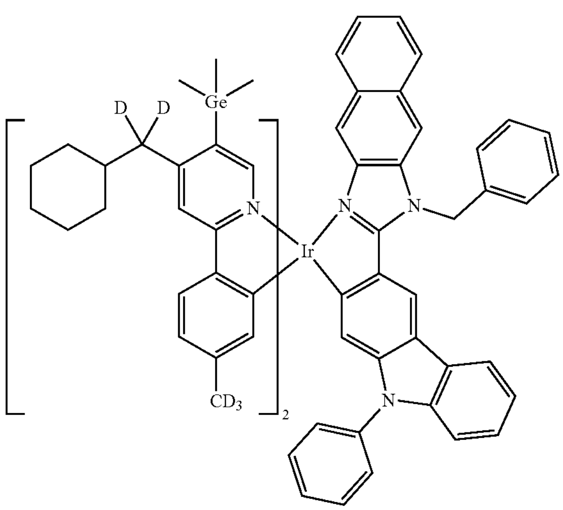
2918
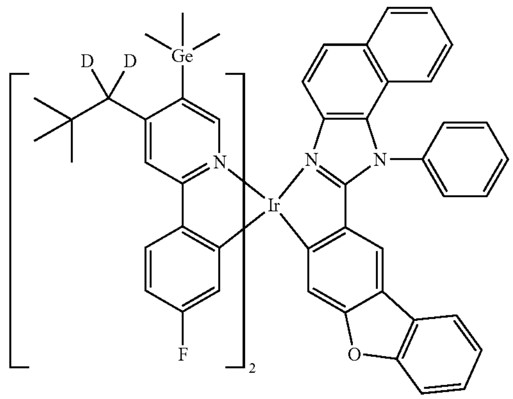
2919
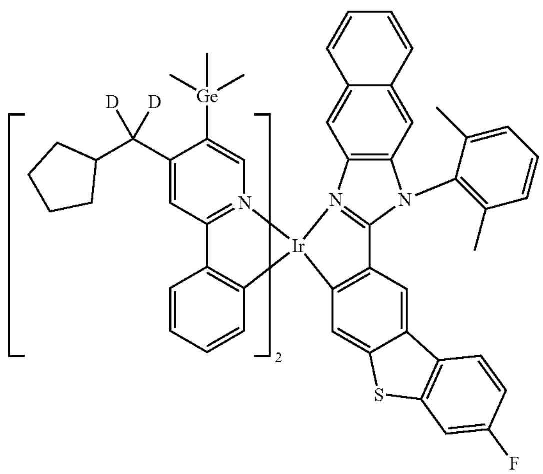
2920
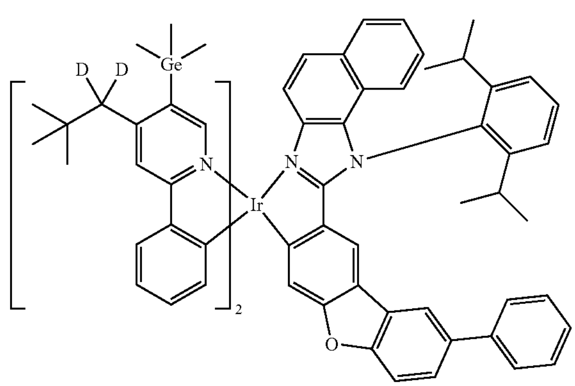

-continued
2921
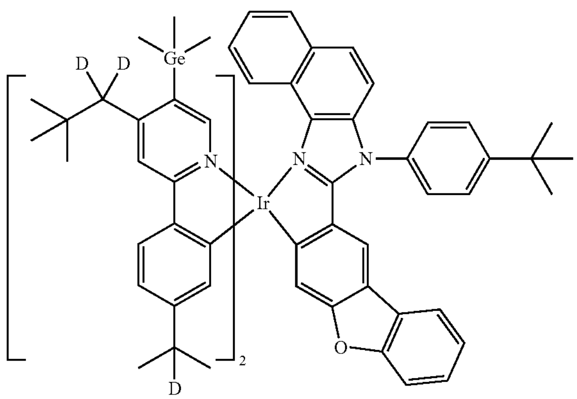
2922
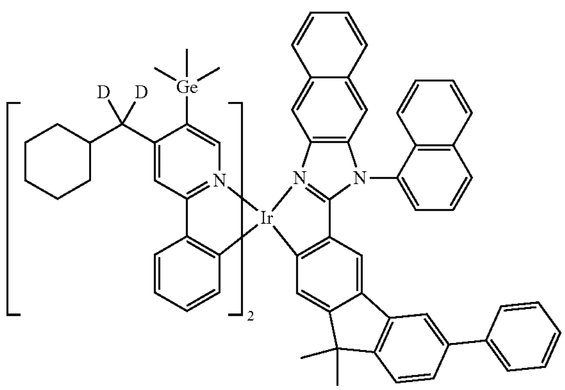
2923
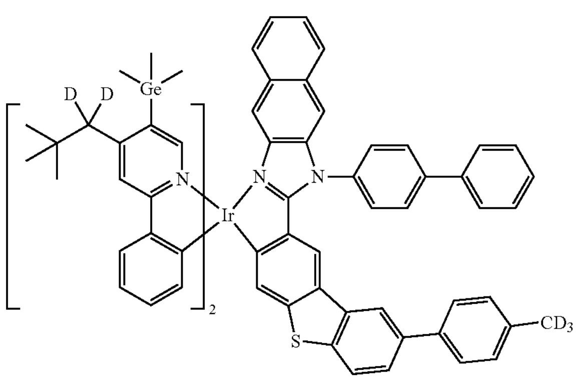
-continued
2924
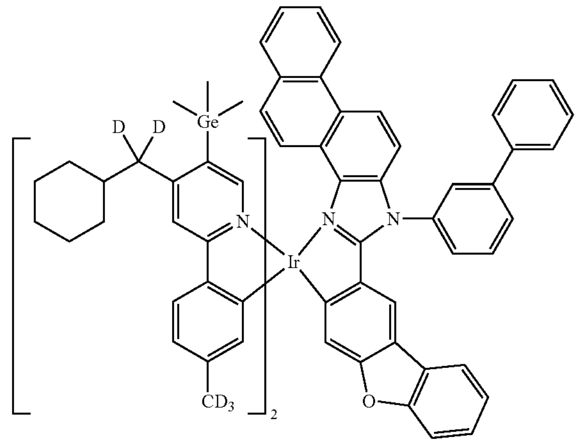
2925
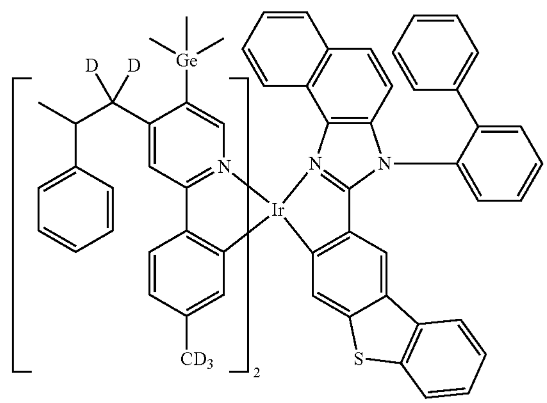
2926
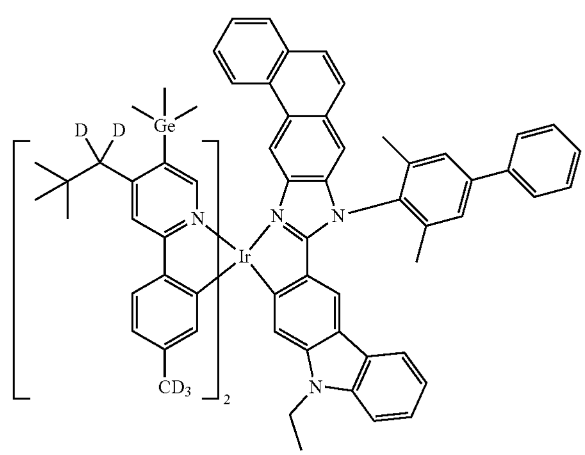

-continued
2927
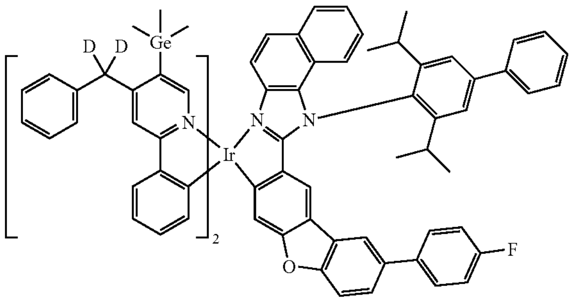
2928
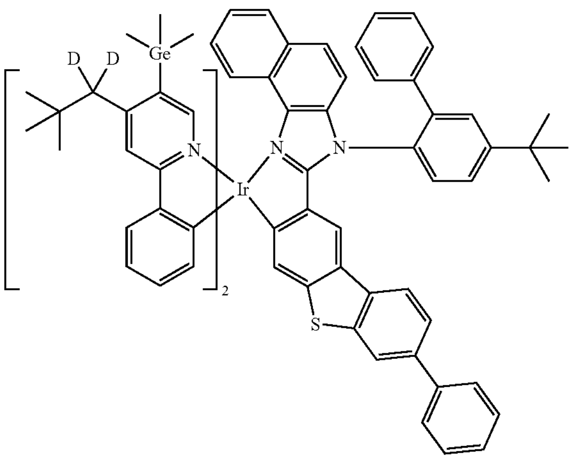
2929
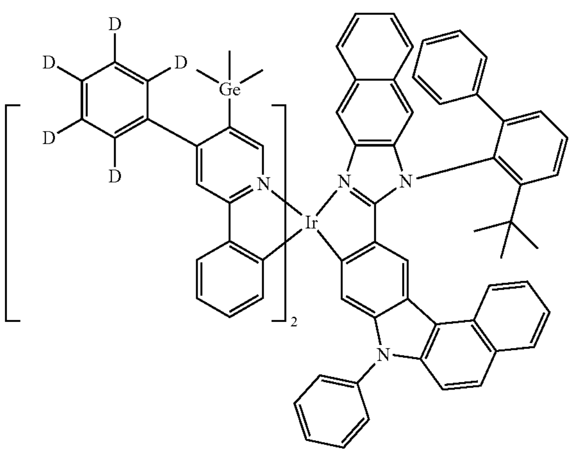
2930
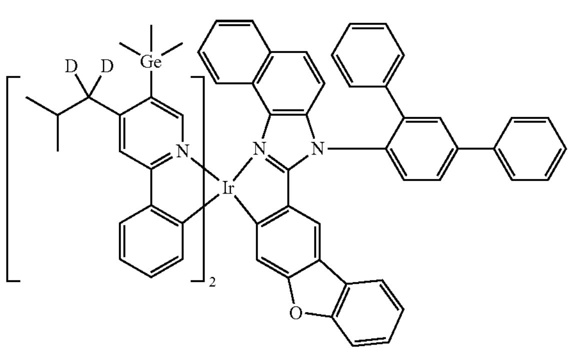
-continued
2931
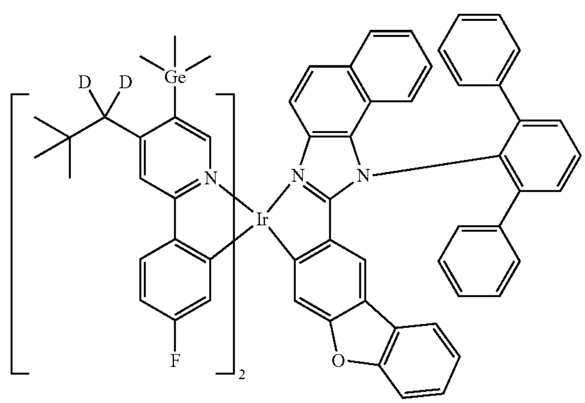
2932
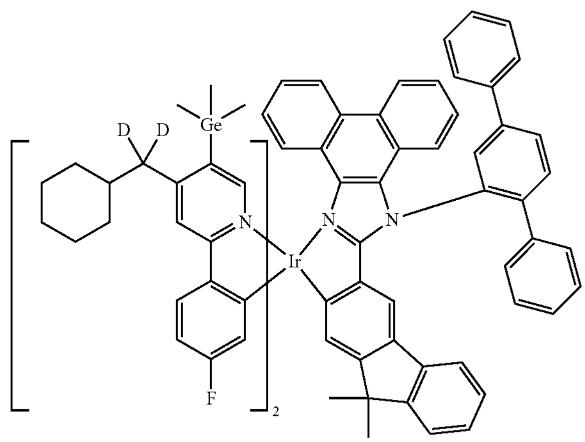
2933
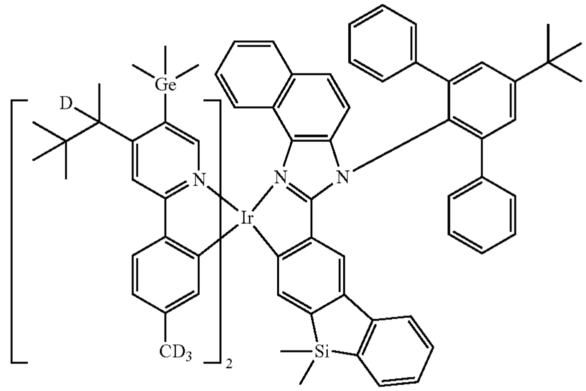

2934
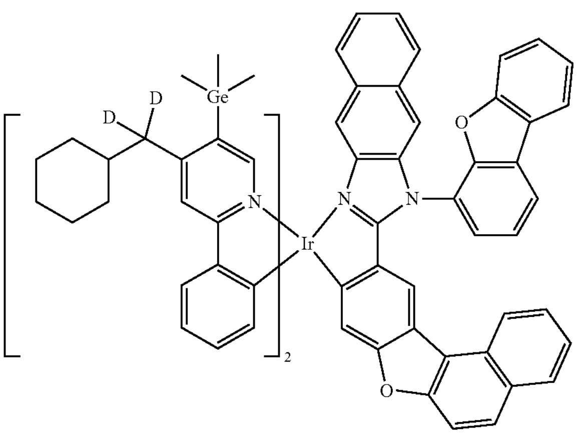
2935
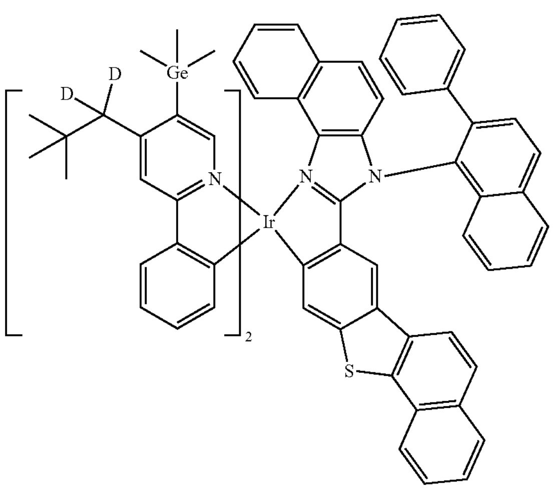
2936
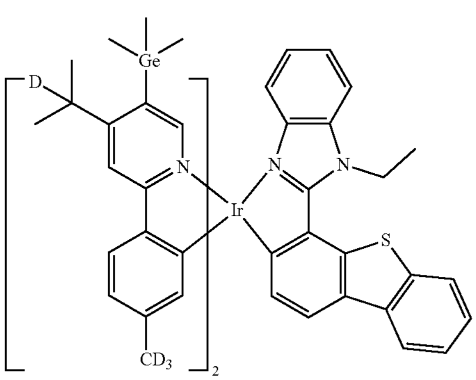
2937
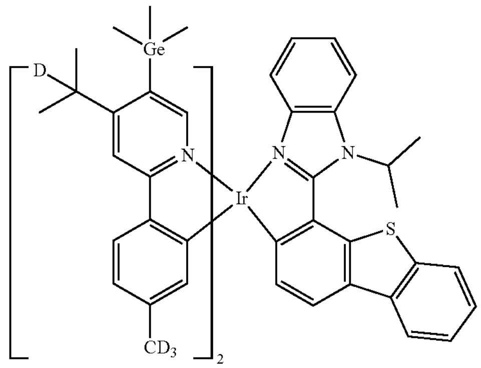
2938
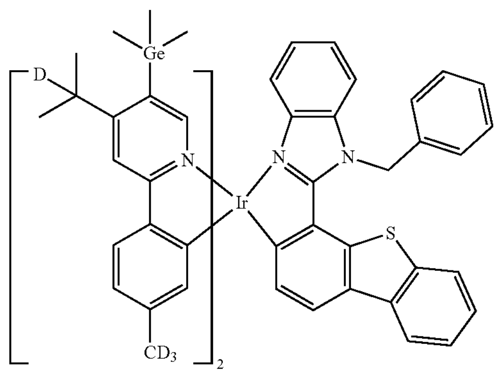
2939
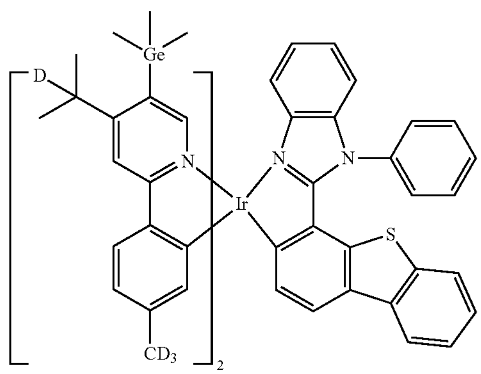
2940
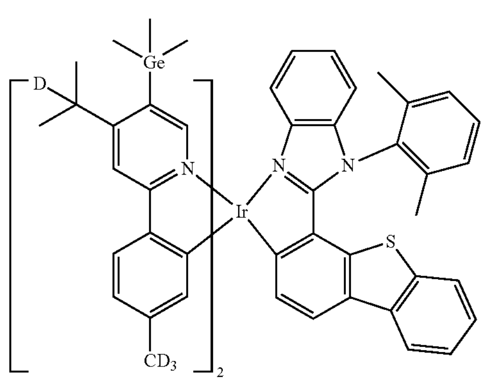

-continued
2941
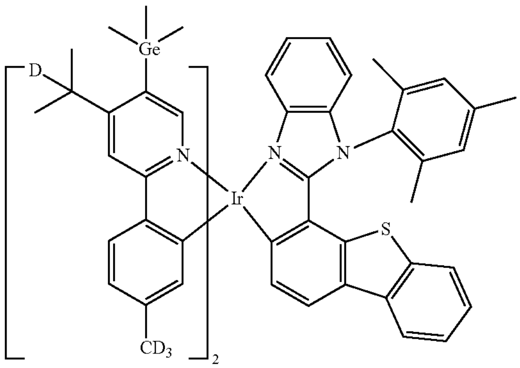
2942
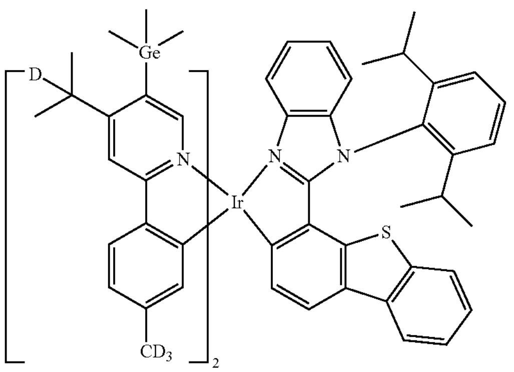
2943
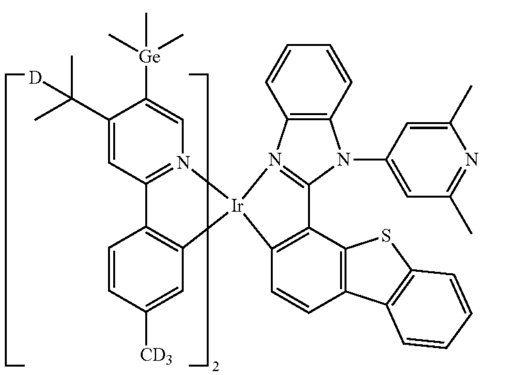
2944
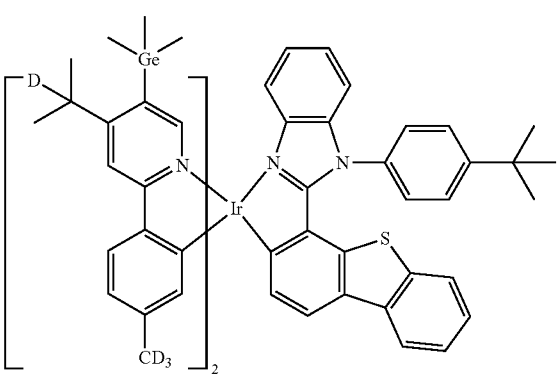
-continued
2945
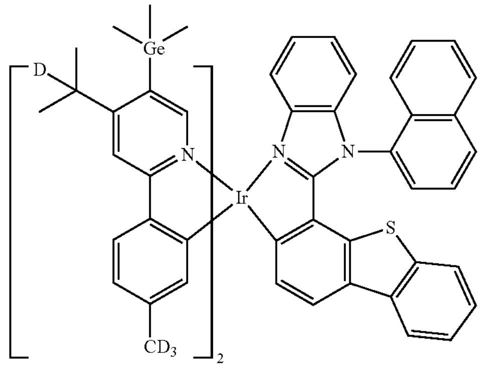
2946
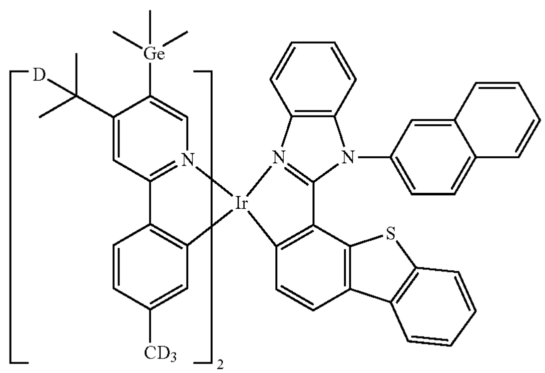
2947
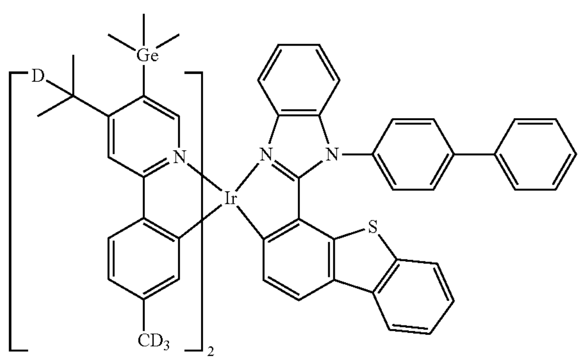
2948
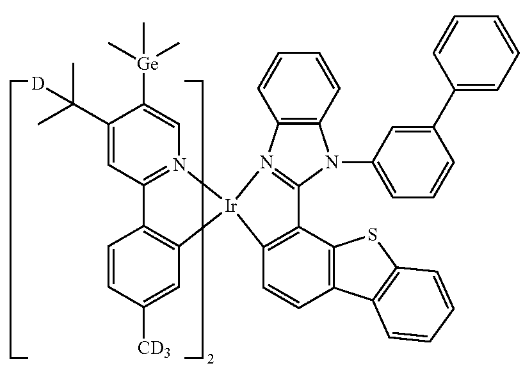

2949
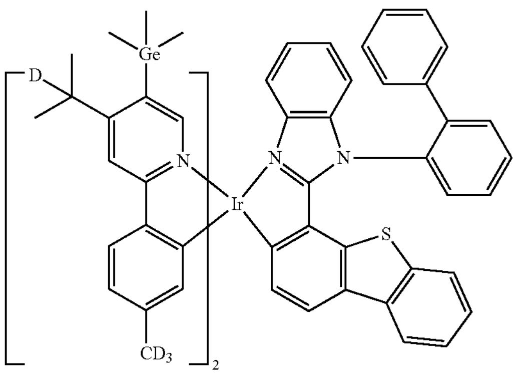
2950
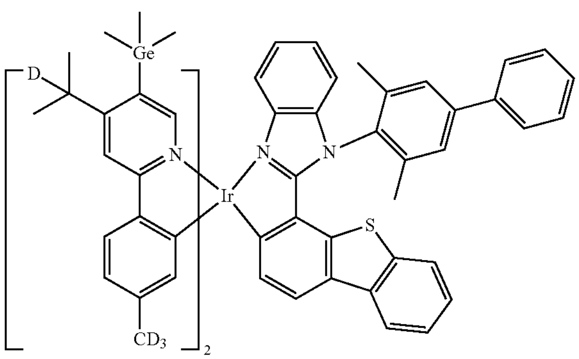
2951
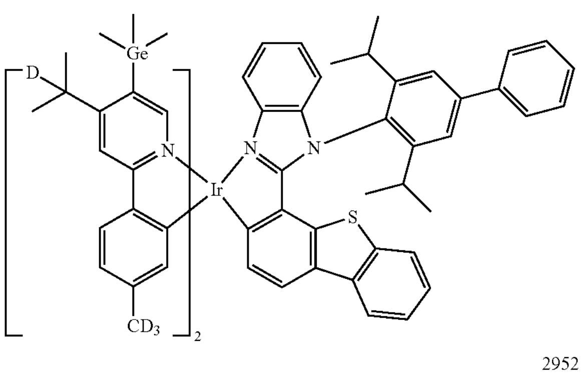
2952
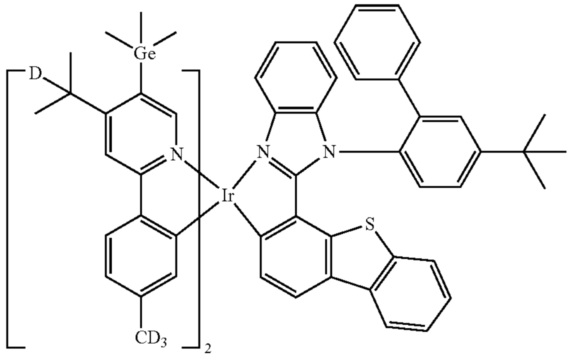
2953
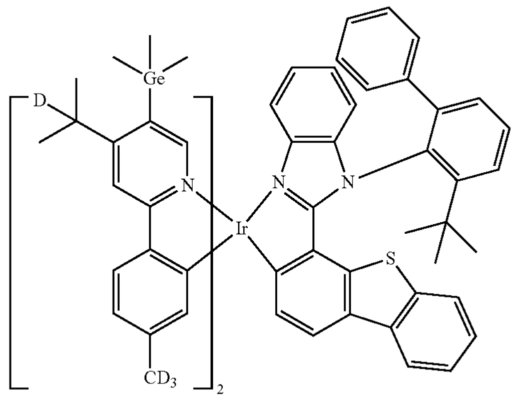
2954
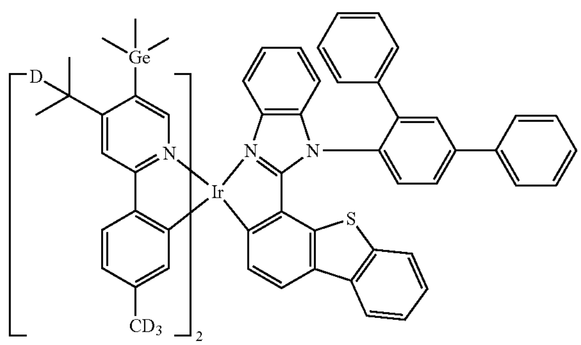
2955
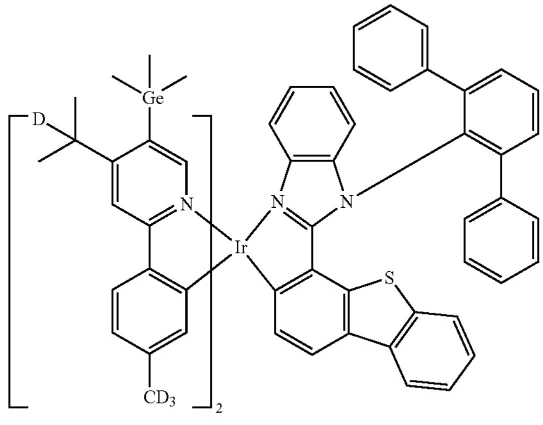

-continued
2956
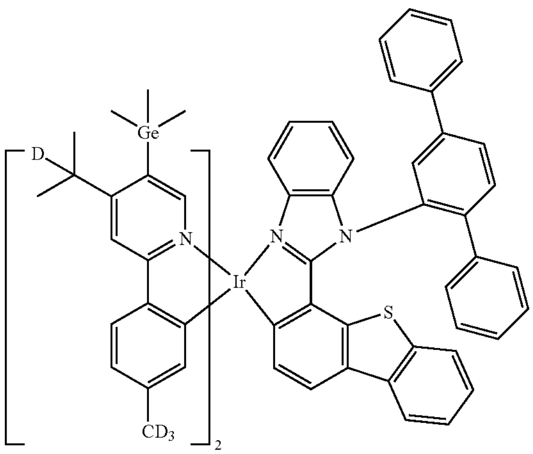
2957
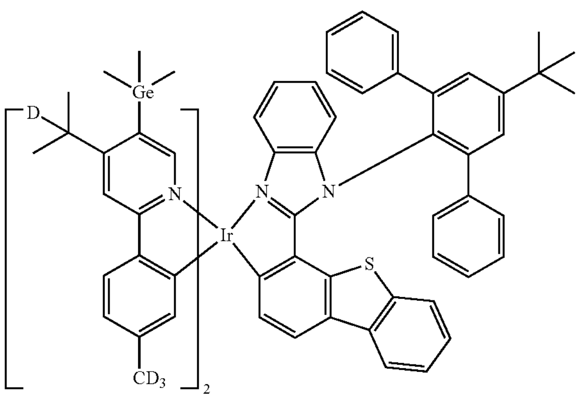
2958
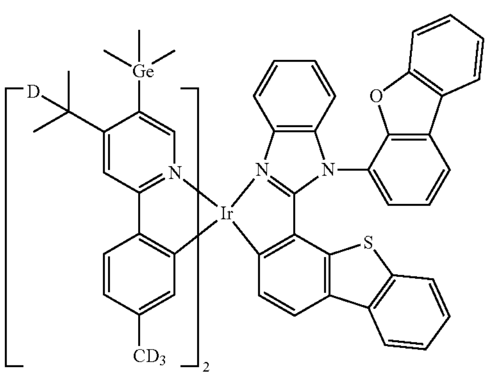
2959
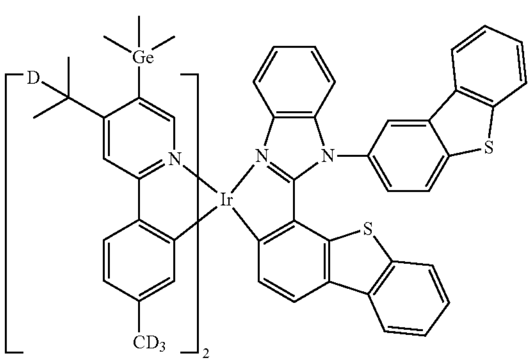
-continued
2960
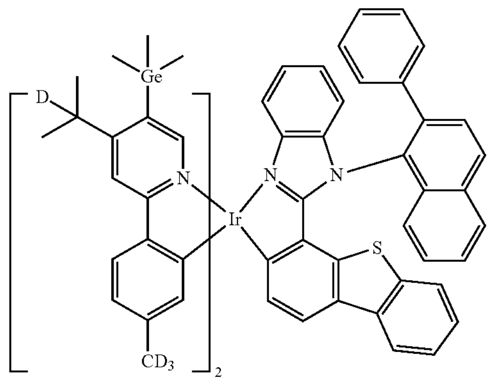
2961
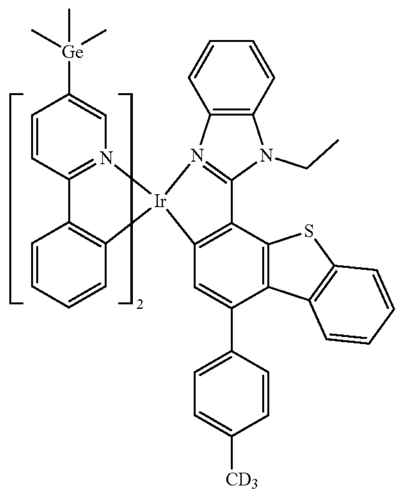
2962
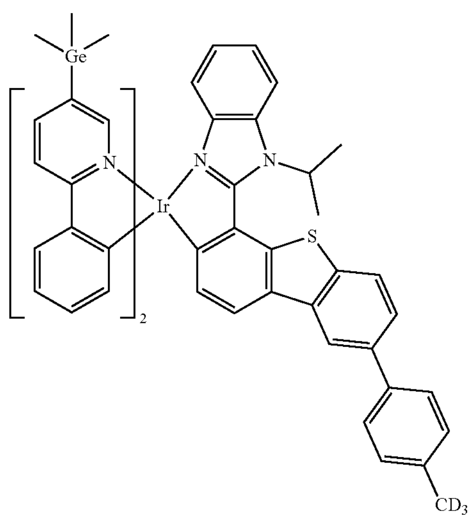

-continued
2963
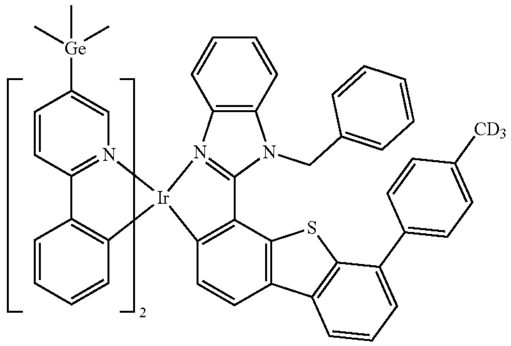
2964
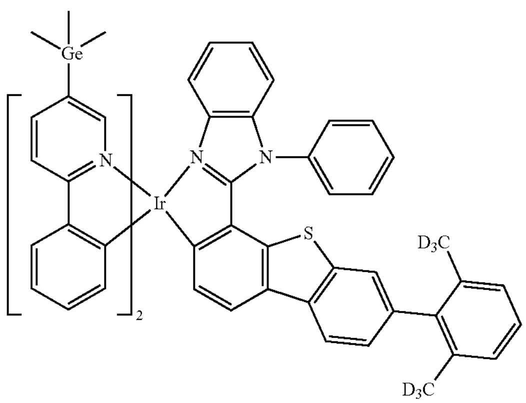
2965
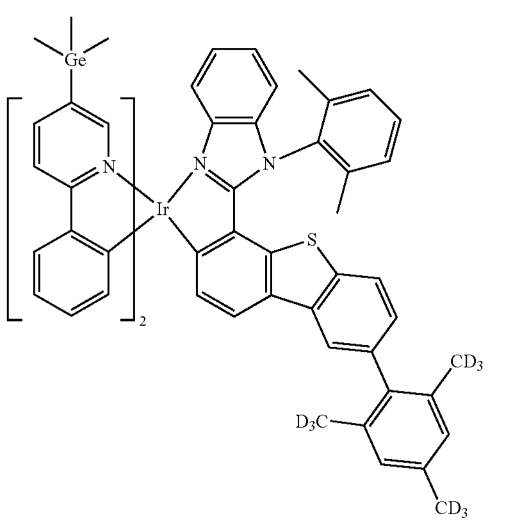
-continued
2966
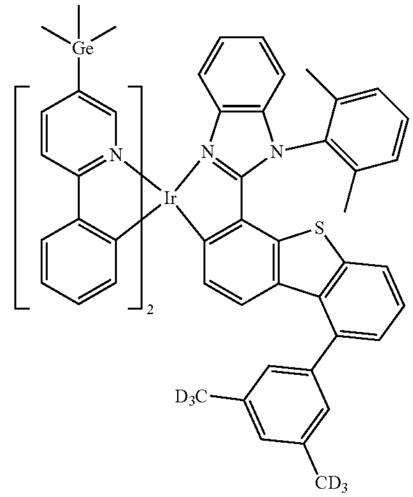
2967
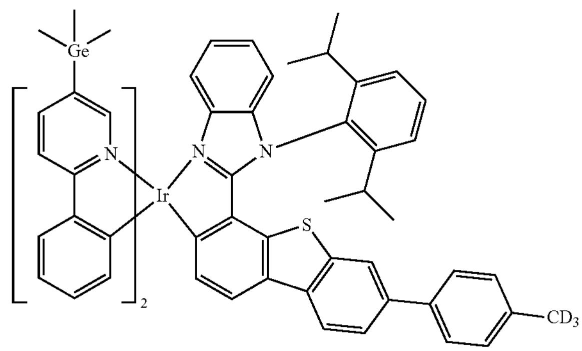
2968
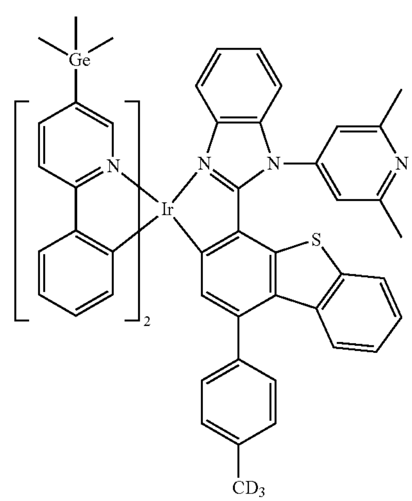

2969
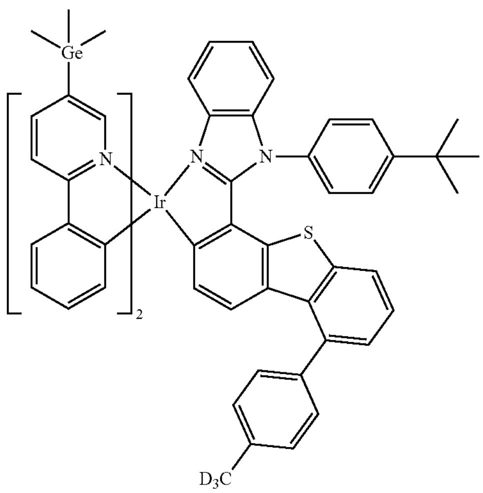
2971
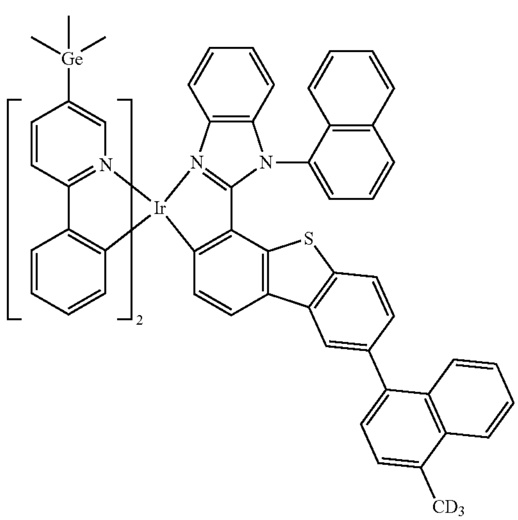
2971
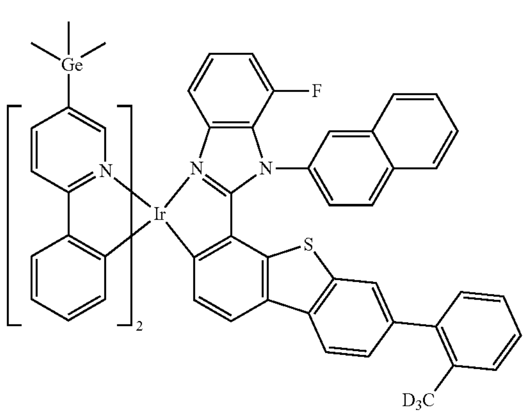
2972
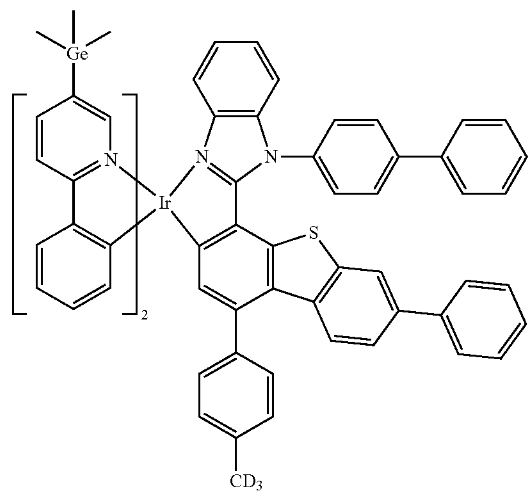
2973
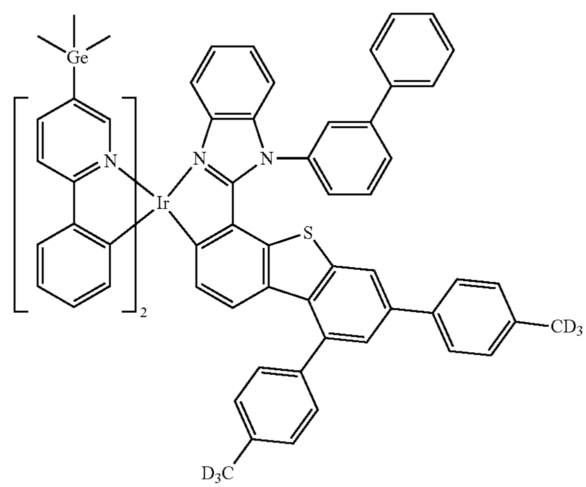
2974
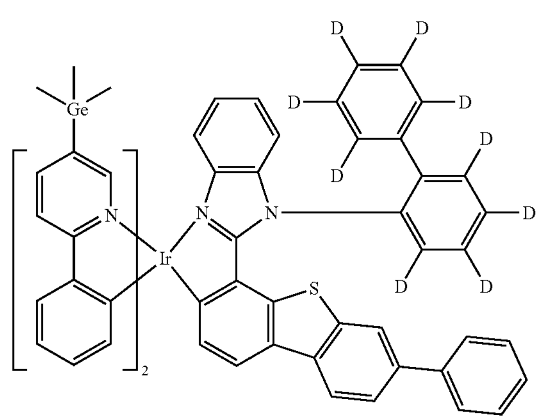

-continued
2975
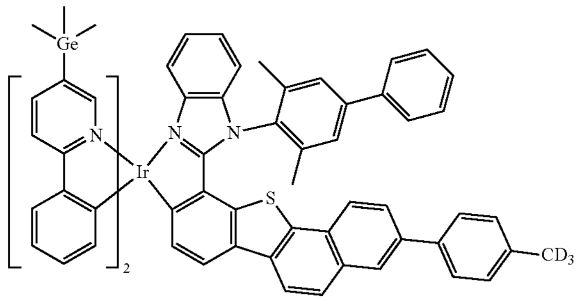
2976
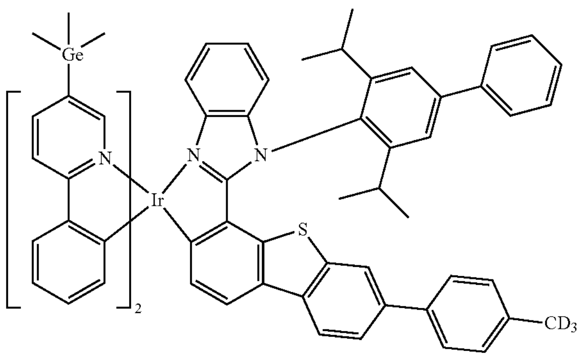
2977
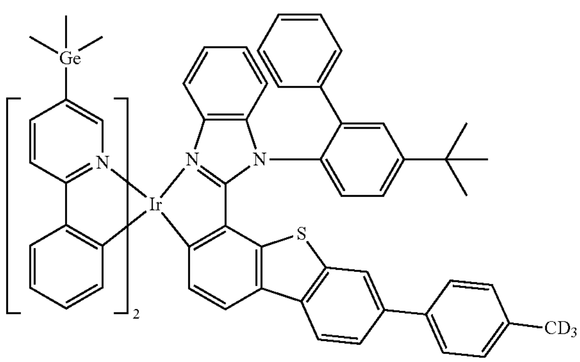
2978
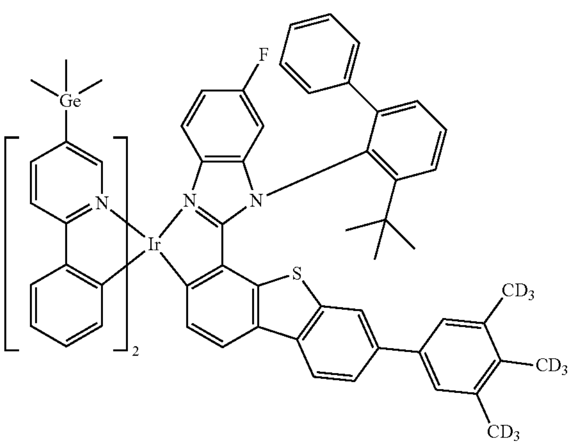
-continued
2979
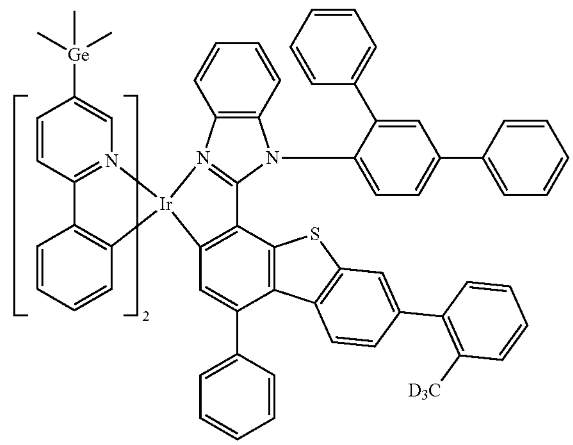
2980
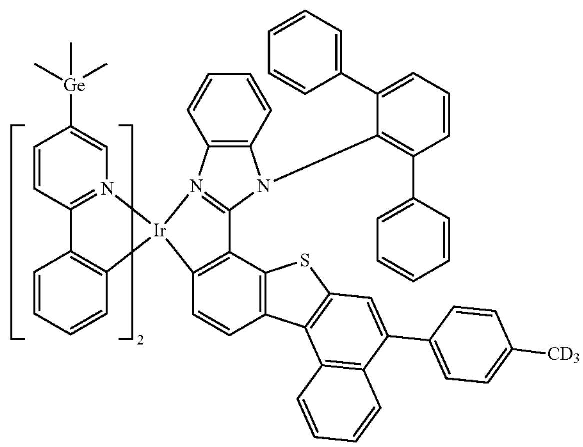
2981
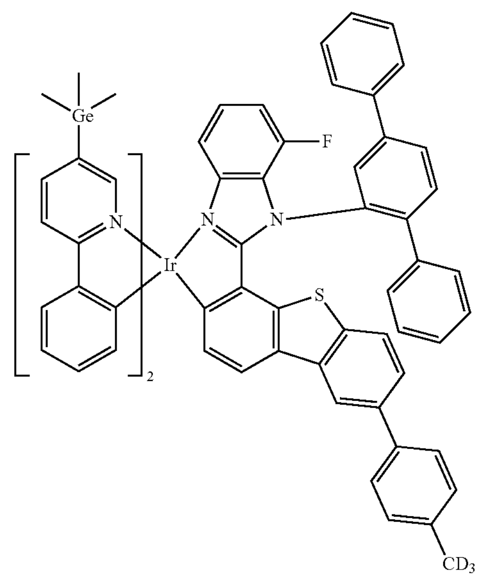

-continued
2982
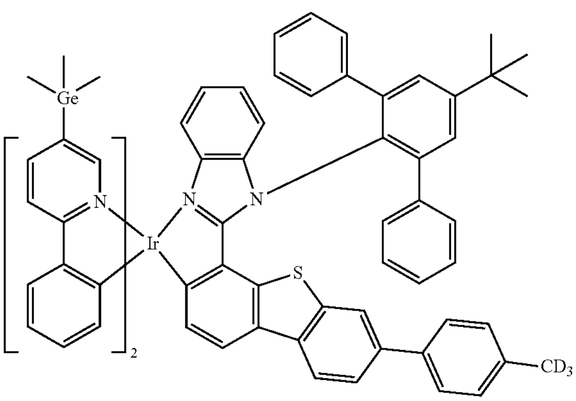
2983
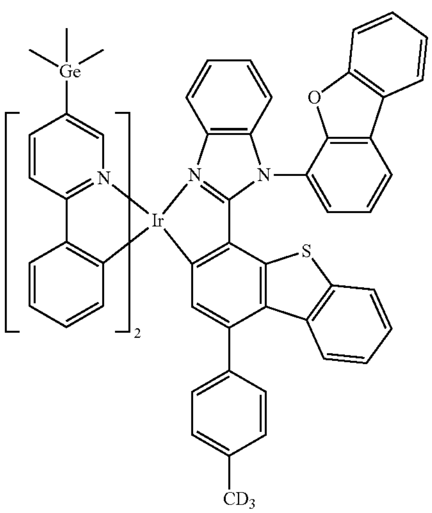
2986
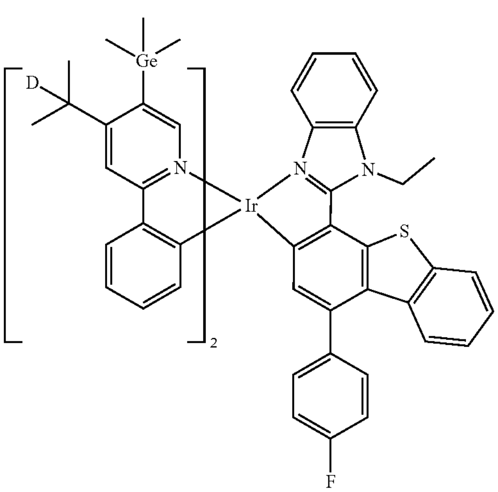
-continued
2984
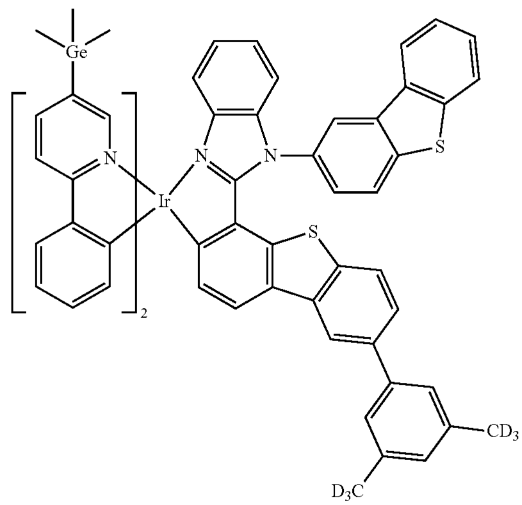
2985
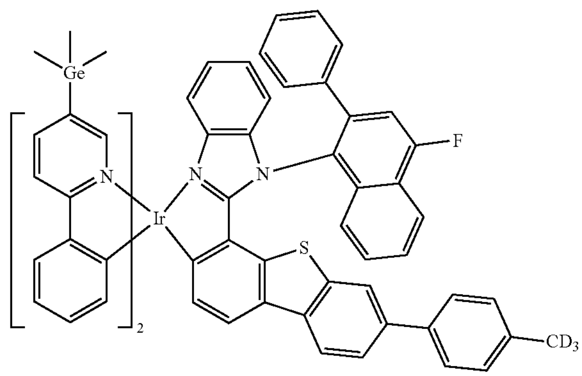
2987
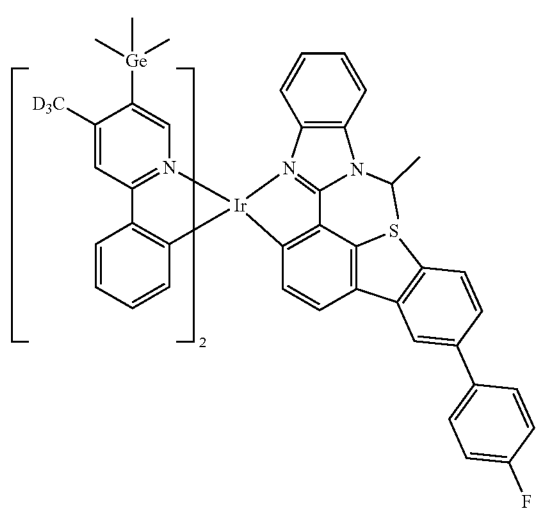

-continued
2988
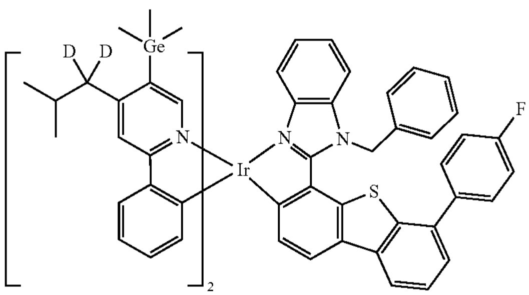
2989
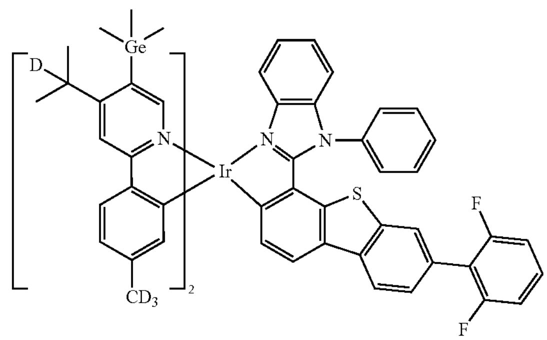
2990
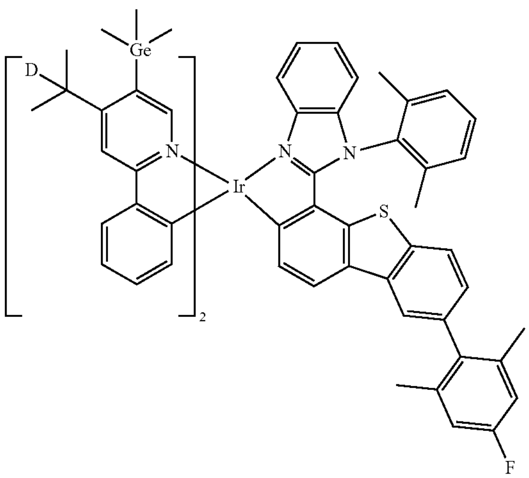
2991
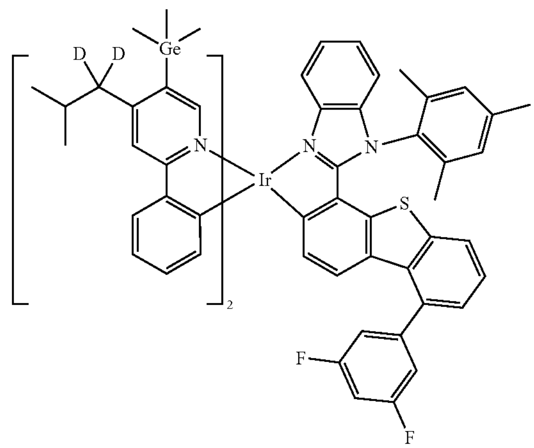
2992
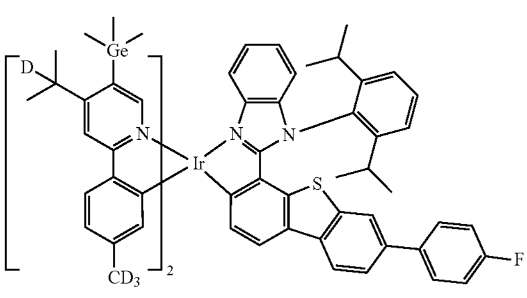
2993
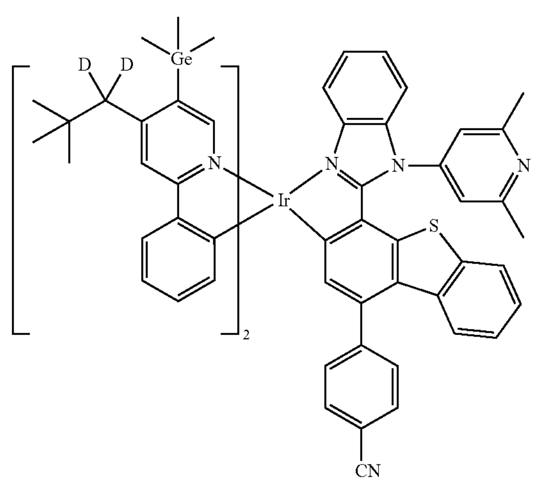

-continued
2994
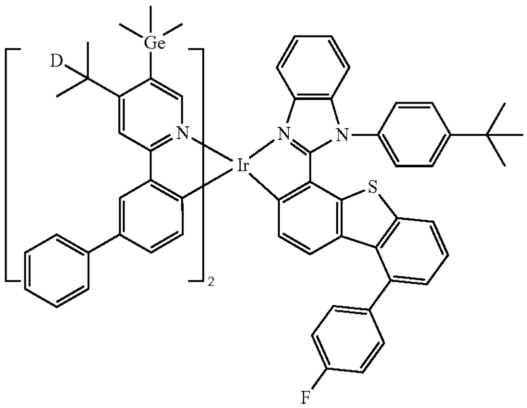
2995
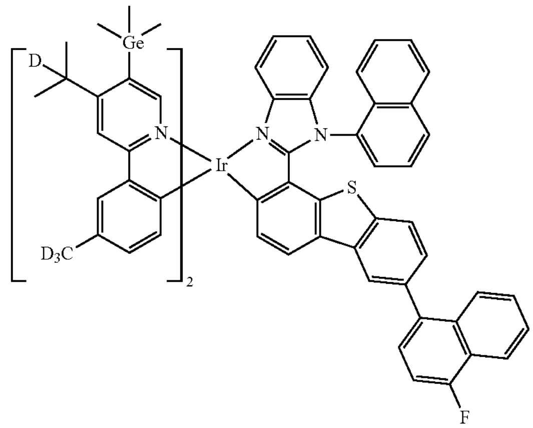
2996
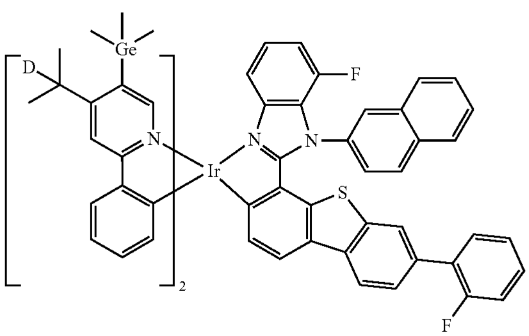
2997
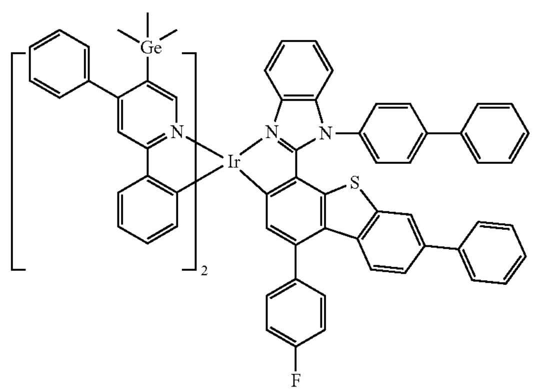
2998
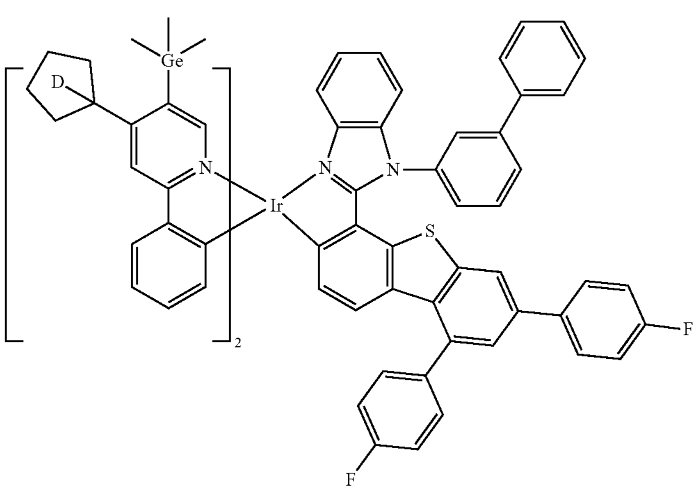

-continued
2999
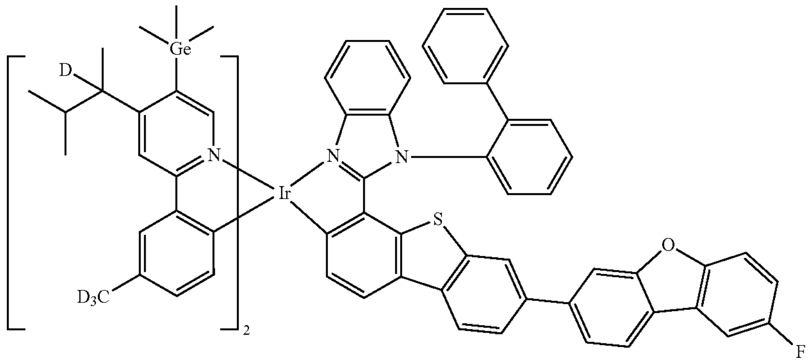
3000
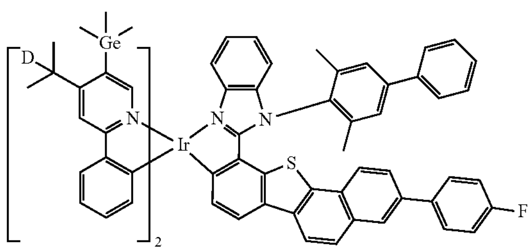
3001
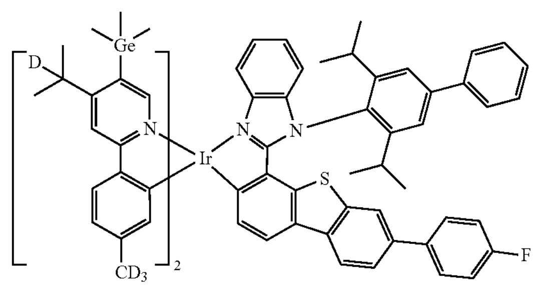
3002
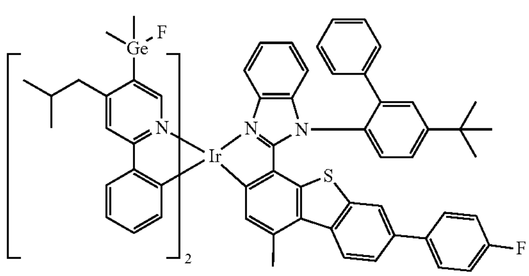
3003
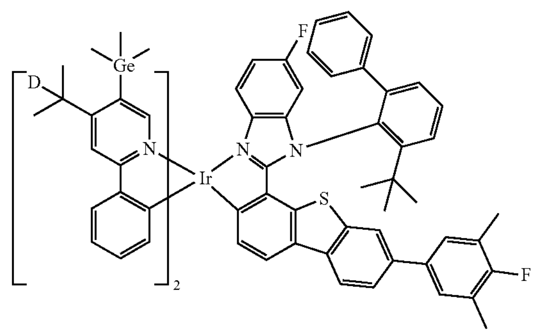
3004
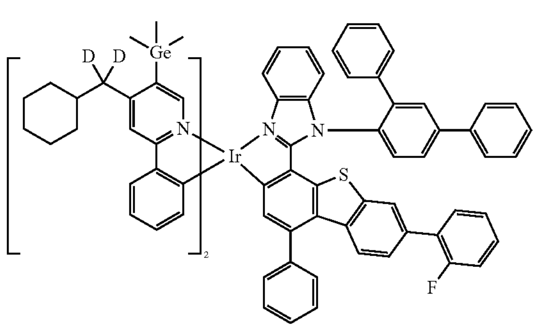
3005
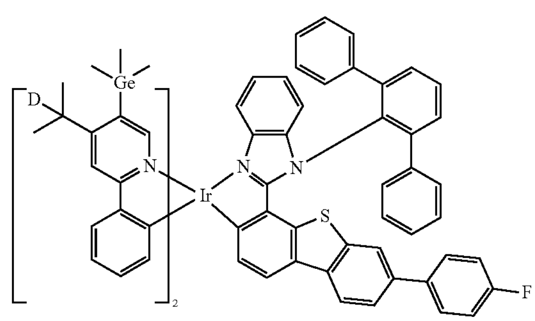

-continued
3006
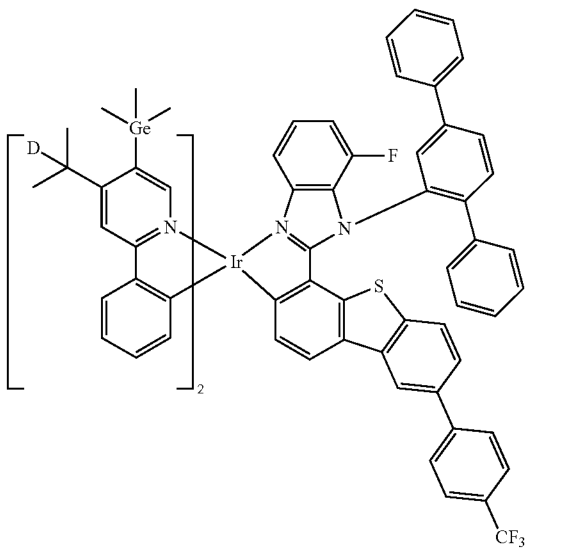
3007
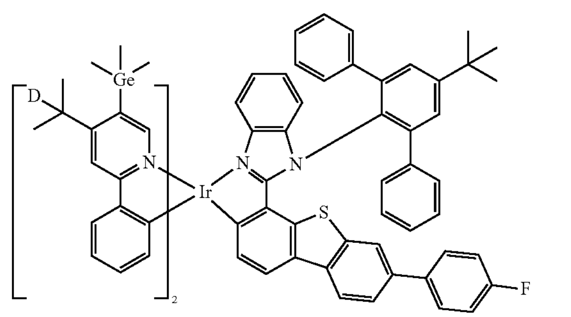
3008
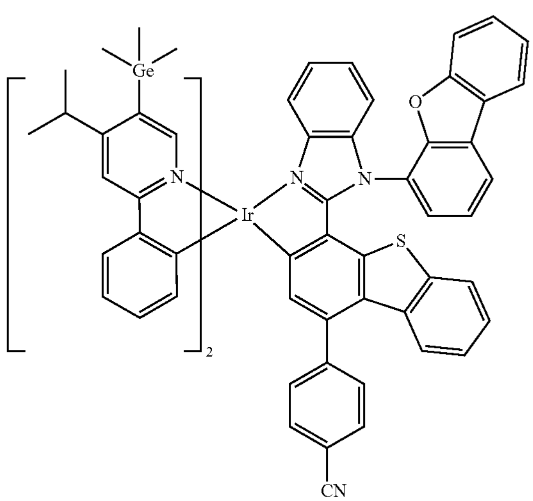
3009
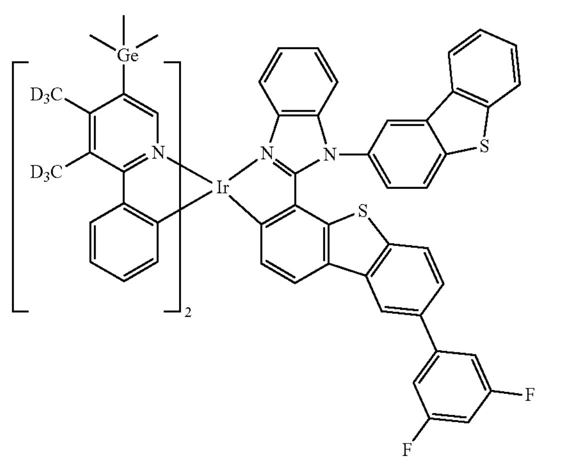
3110
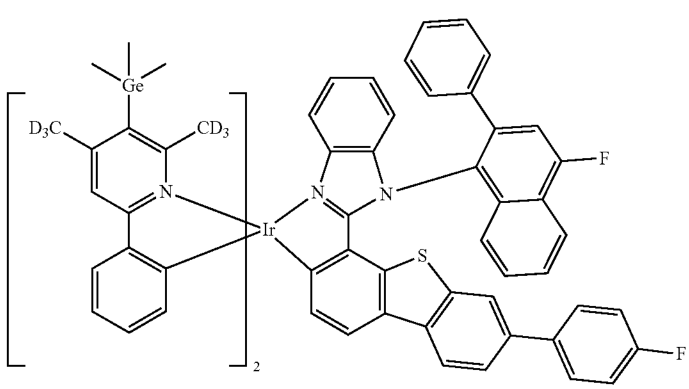

-continued
3011
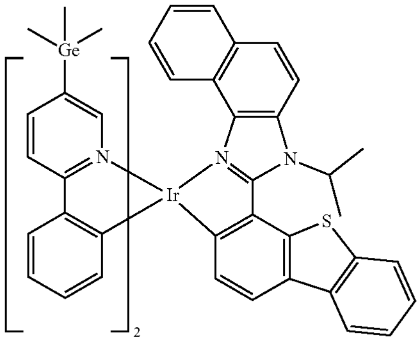
3012
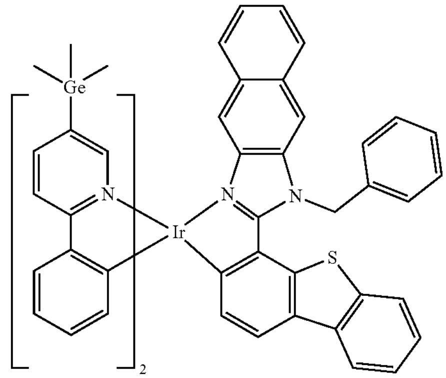
3013
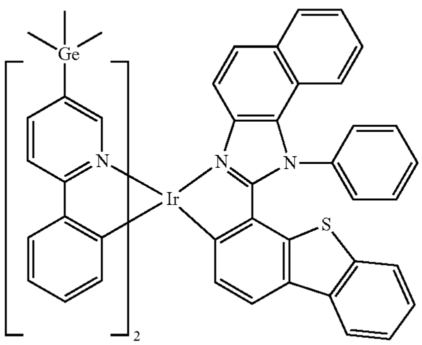
3014
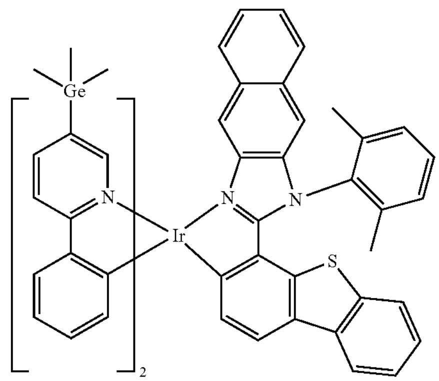
3015
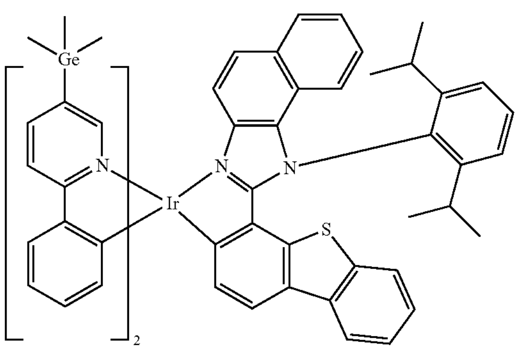
3016
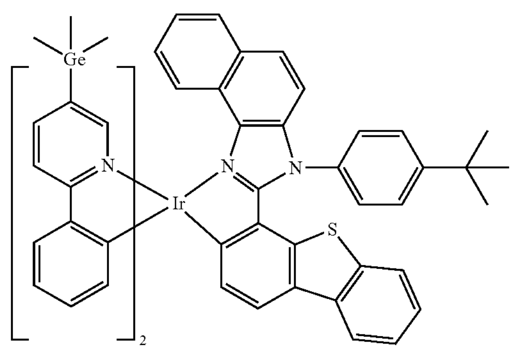
3017
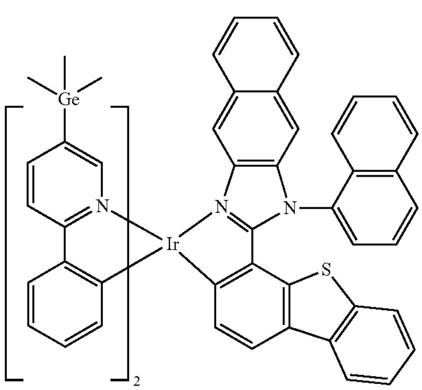
3018
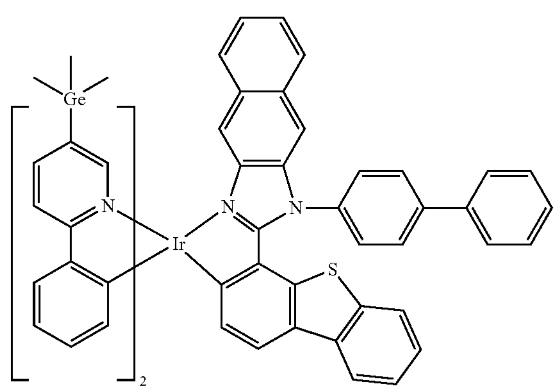

-continued
3019
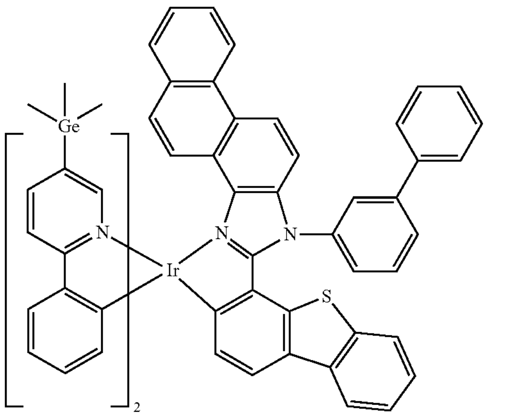
3020
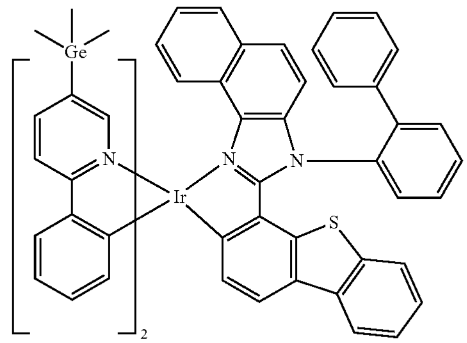
3021
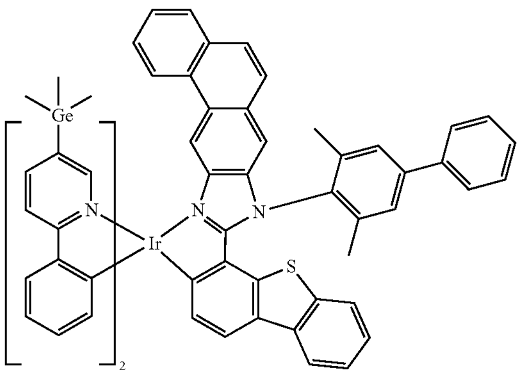
3022
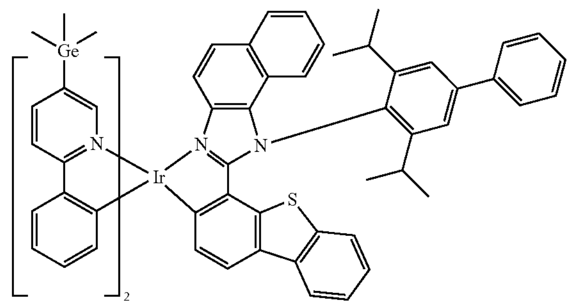
3023
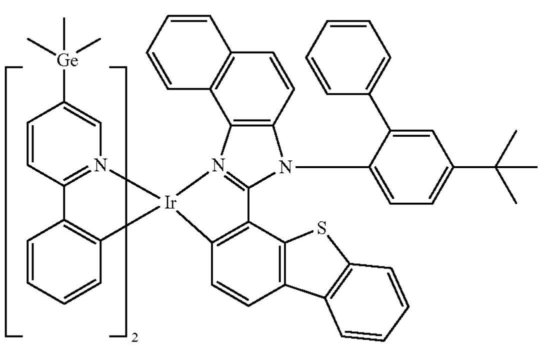
3024
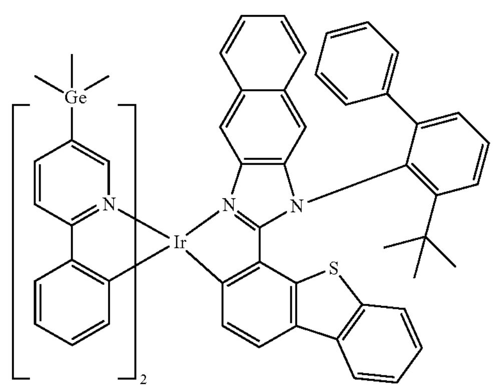
3025
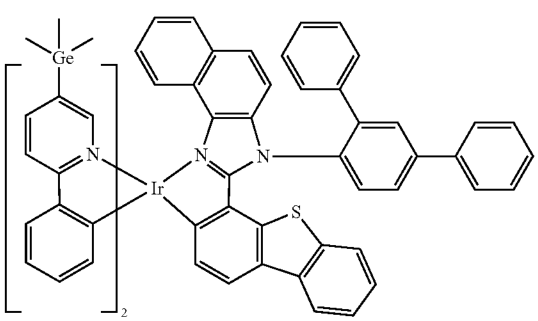
3026
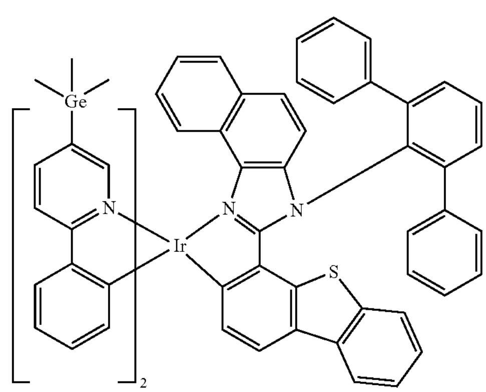

-continued
3027
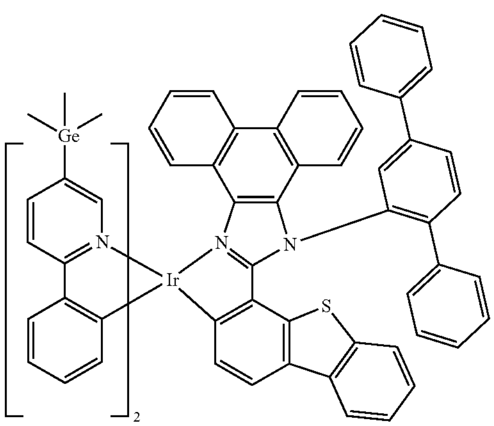
3028
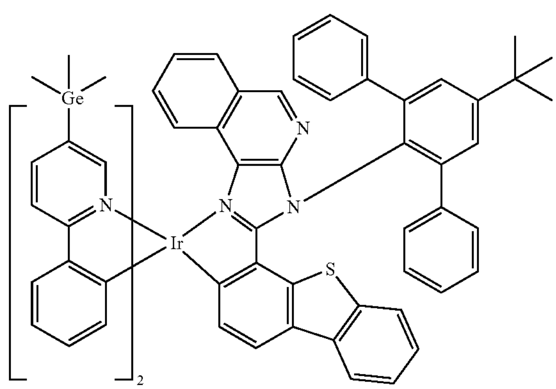
3029
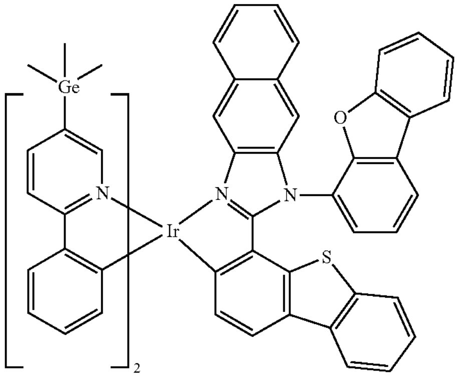
3030
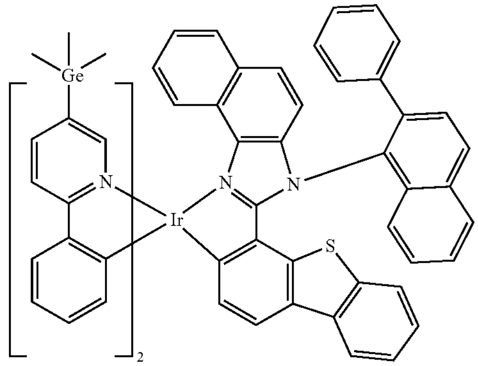
3031
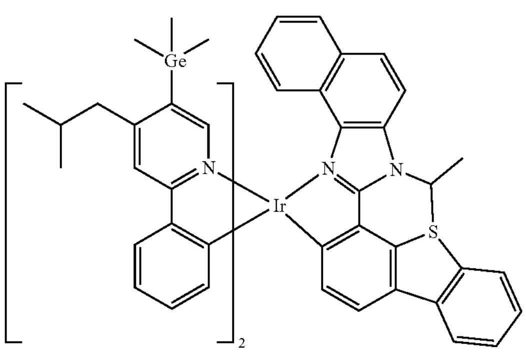
3032
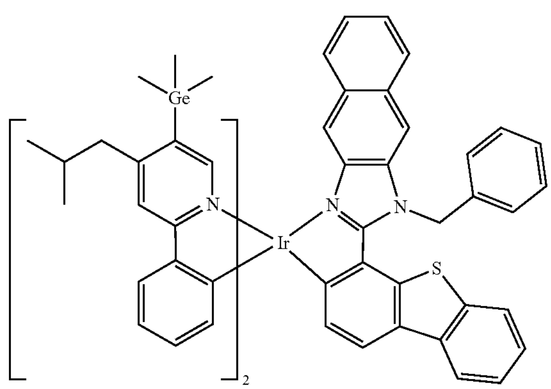
3033
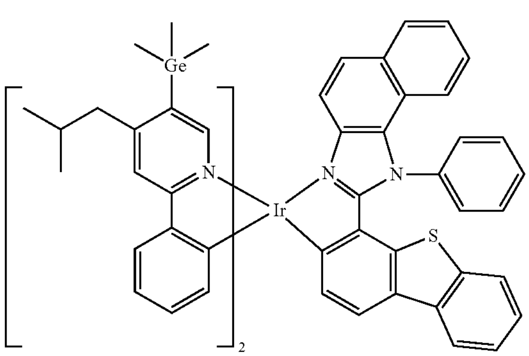
3034
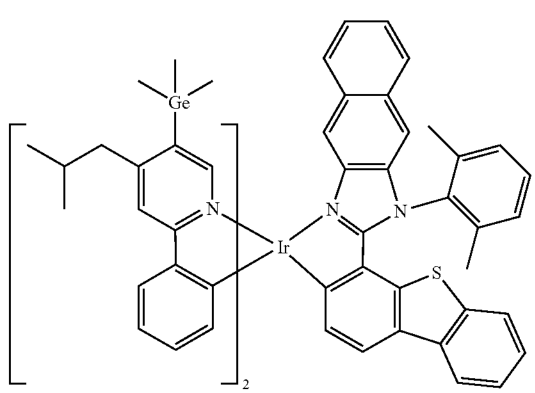

-continued
3035
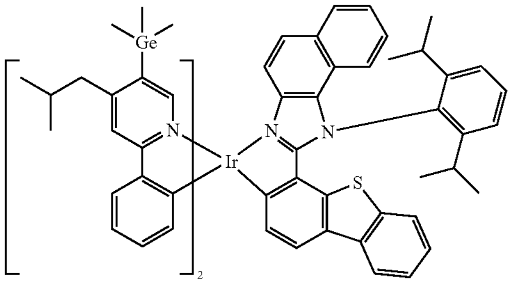
3036
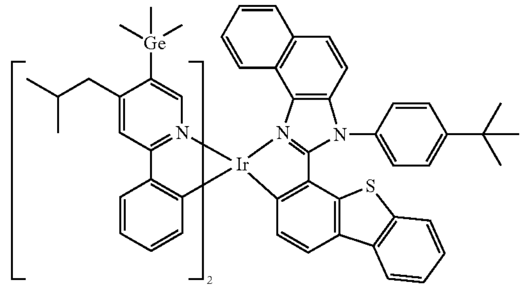
3037
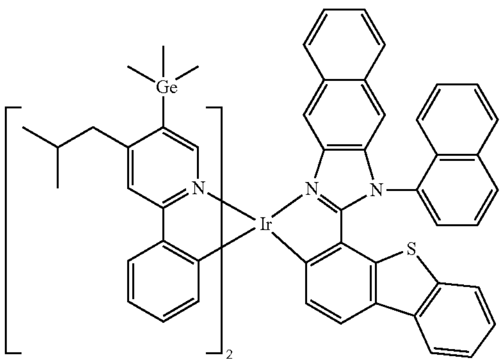
3038
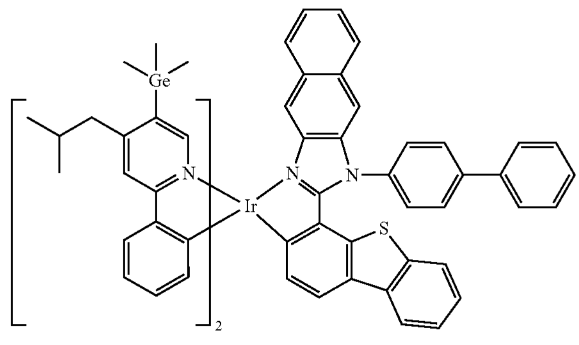
3039
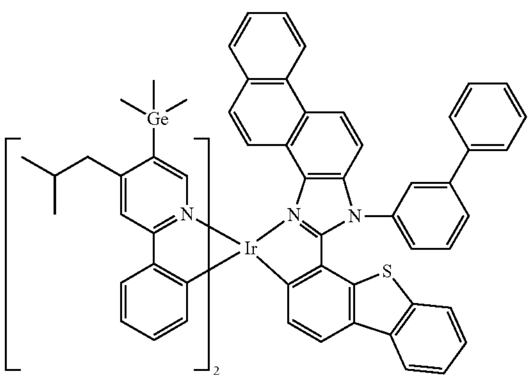
3040
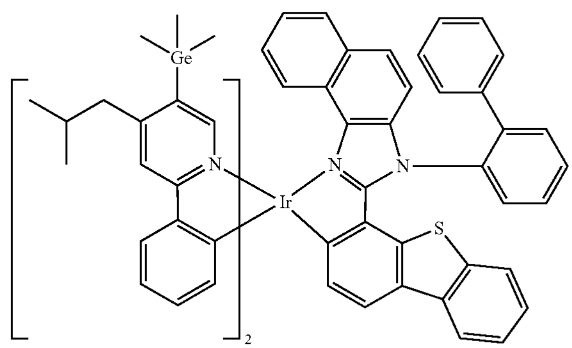
3041
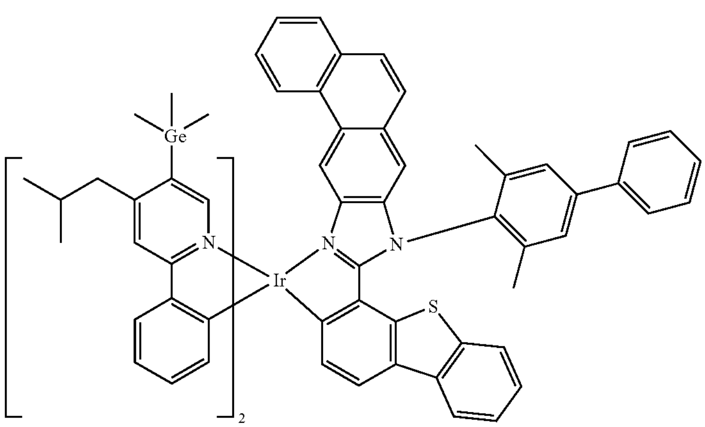

-continued
3042
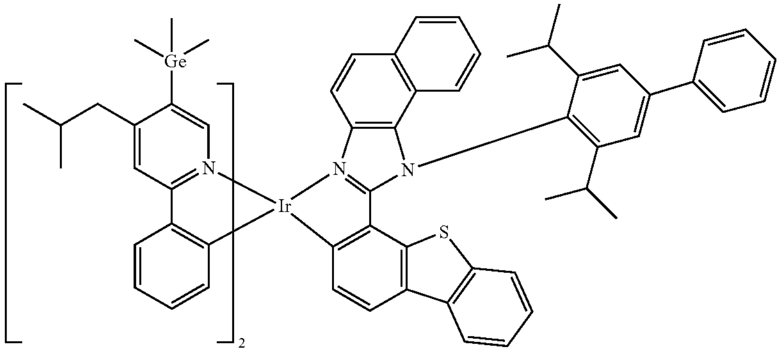
3043
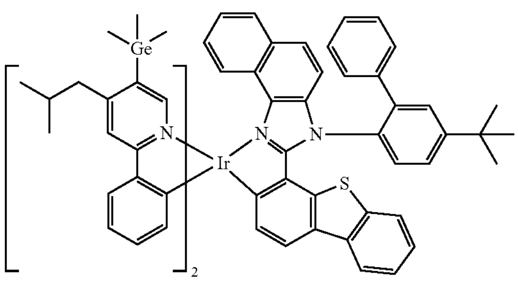
3044
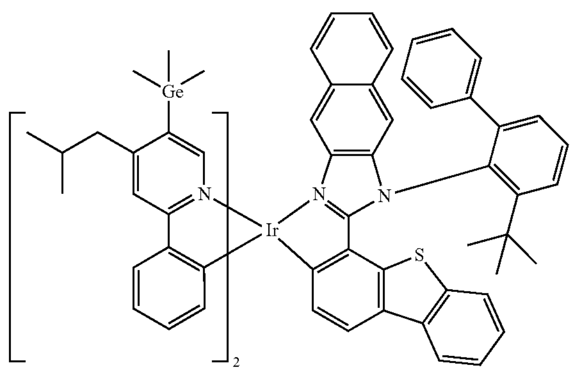
3045
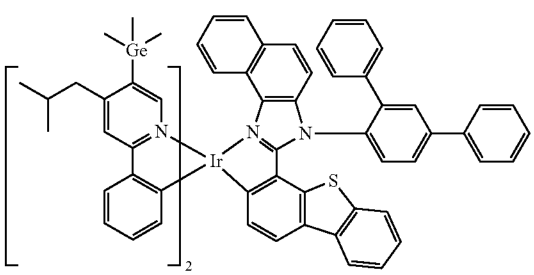
3046
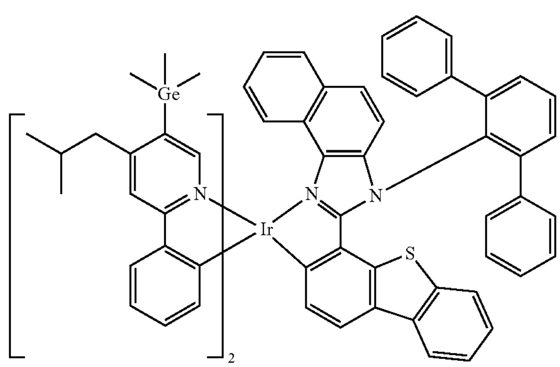
3047
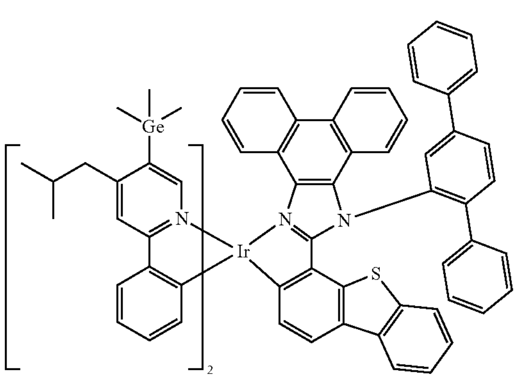
3048
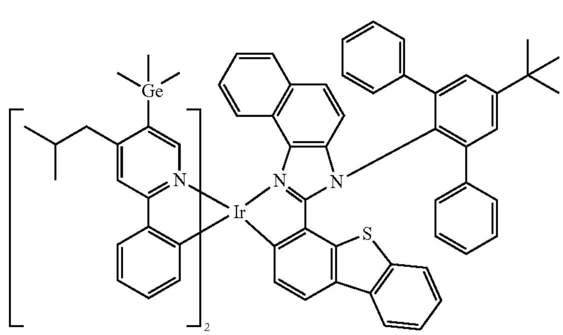

-continued
3049
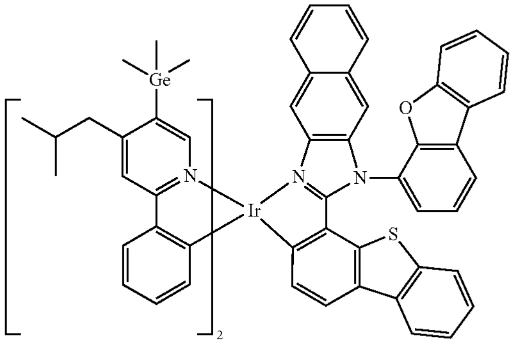
3050
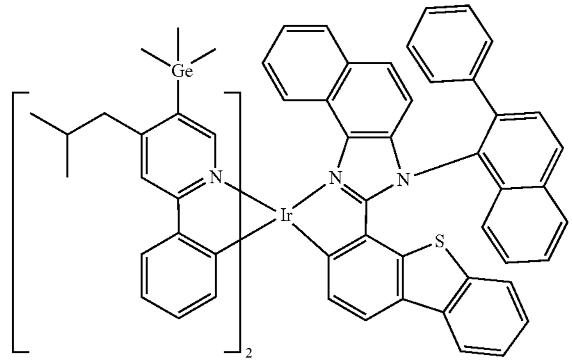
3051
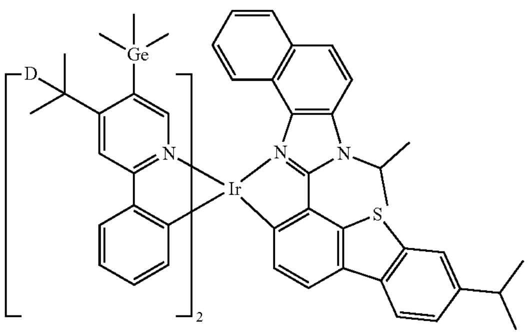
3052
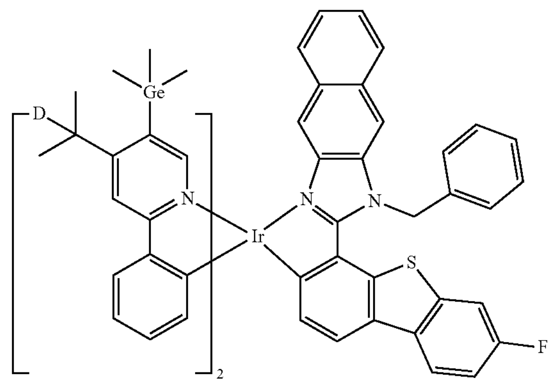
3053
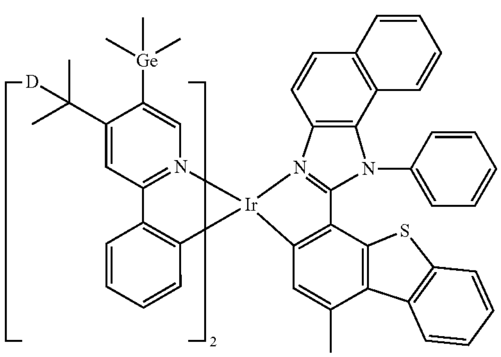
3054
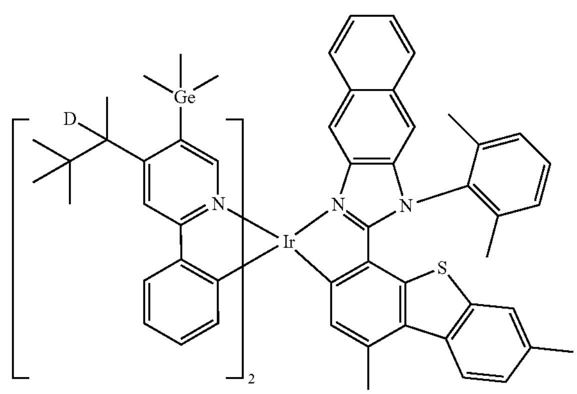
3055
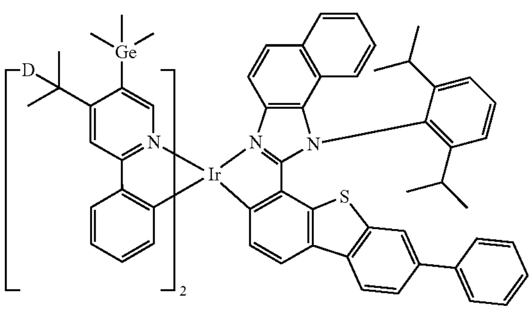
3056
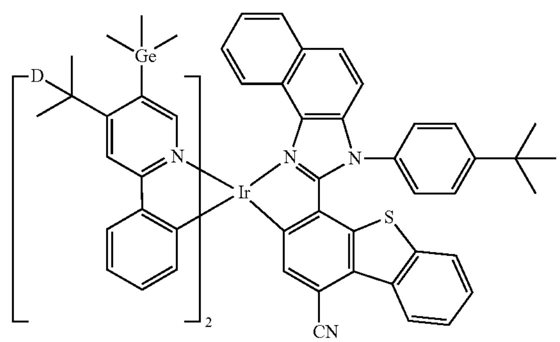

-continued
3057
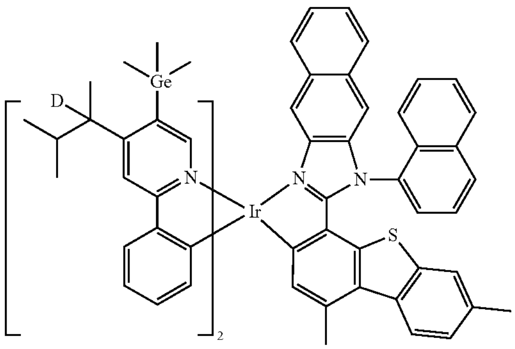
3058
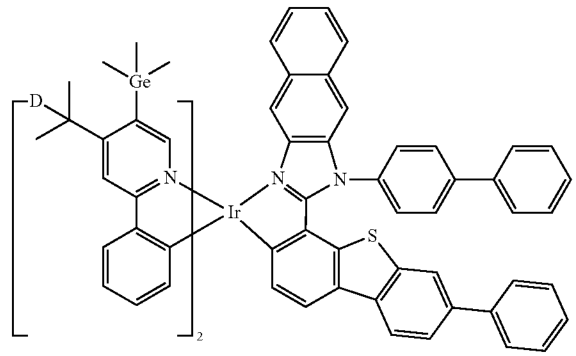
3059
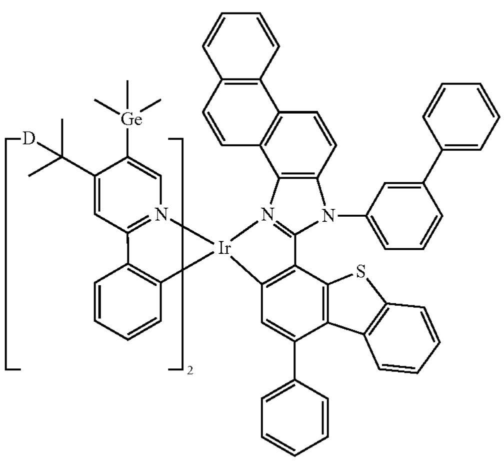
3060
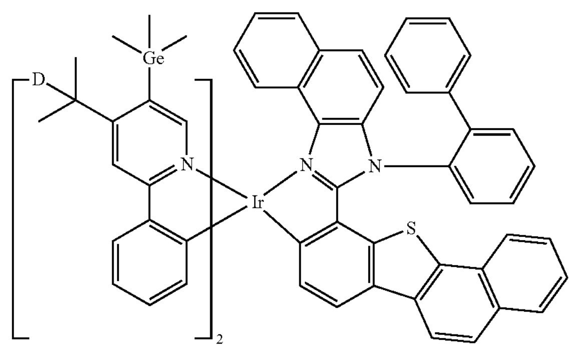
3061
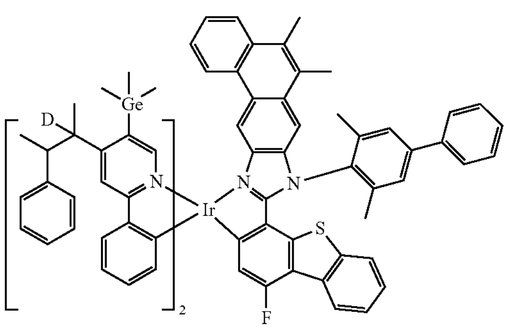
3062
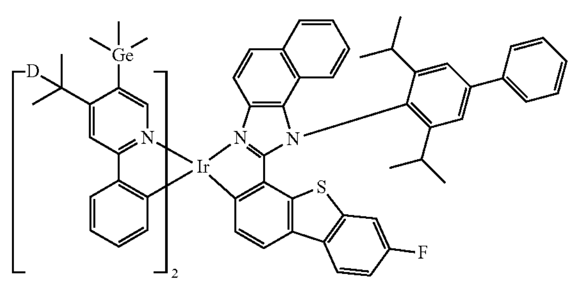
3063
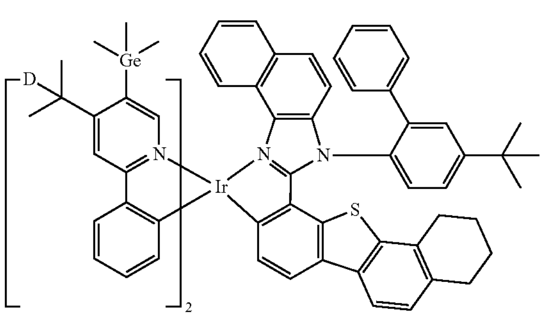
3064
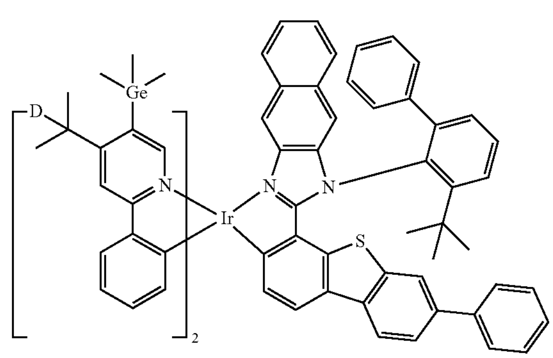

-continued
3065
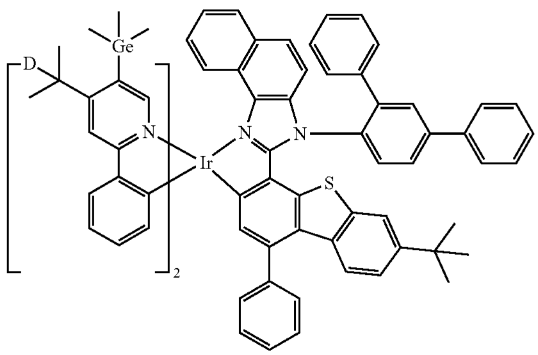
3066
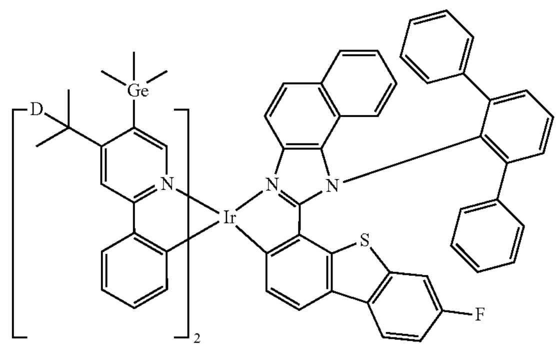
3067
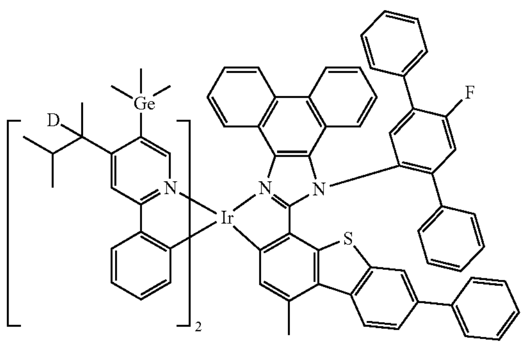
3068
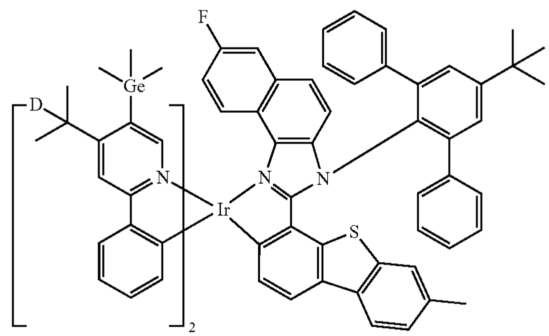
3069
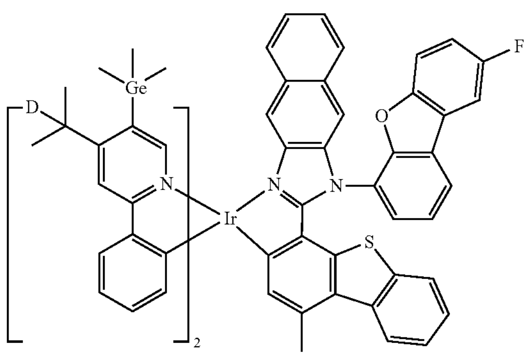
3070
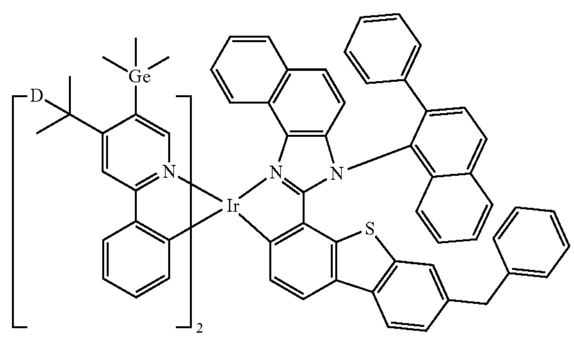
3071
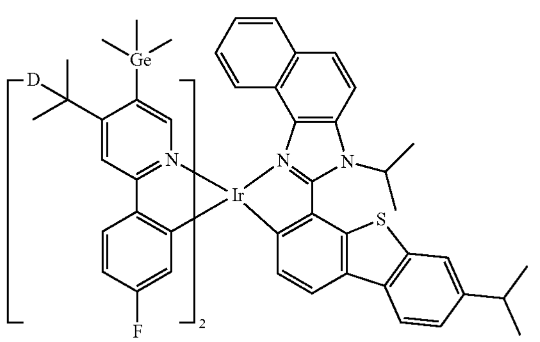
3072
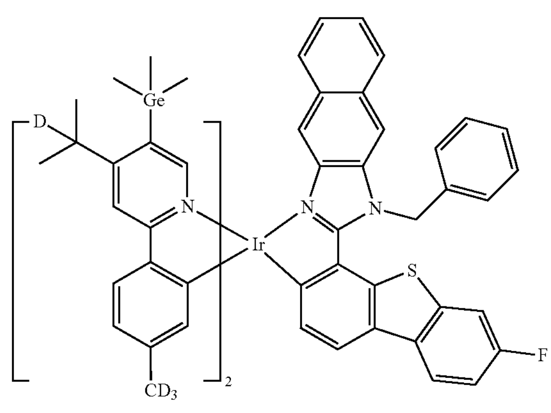

-continued
3073
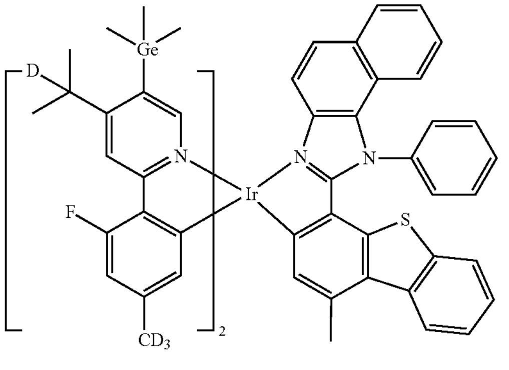
3074
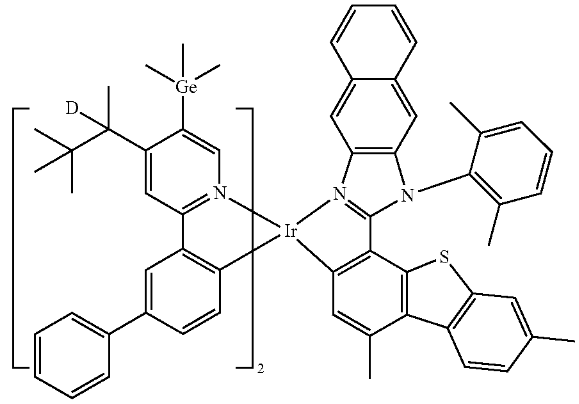
3075
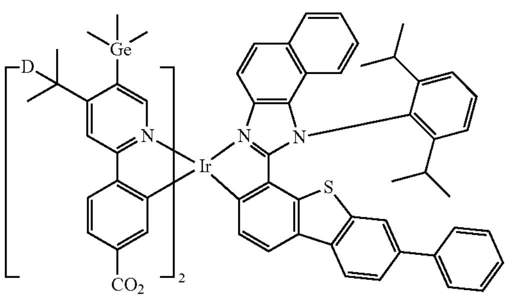
3076
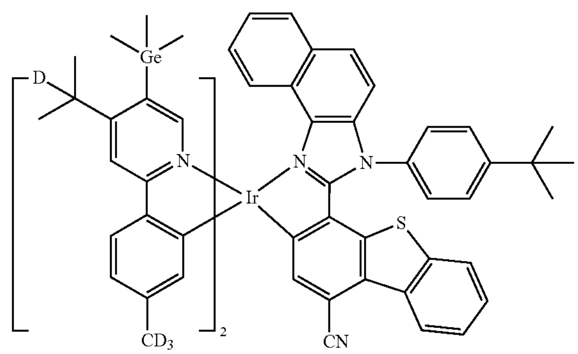
3077
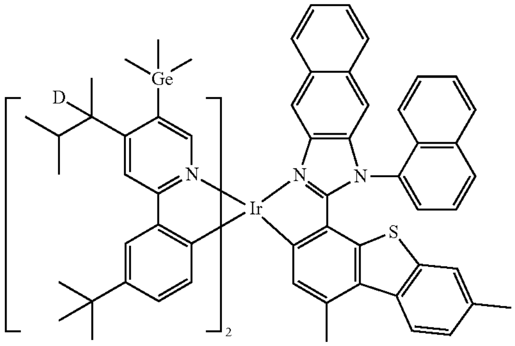
3078
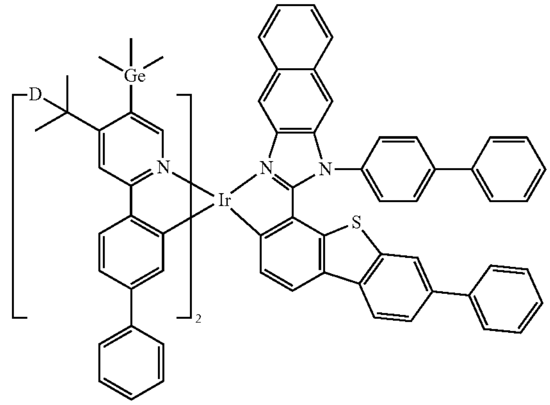

-continued
3079
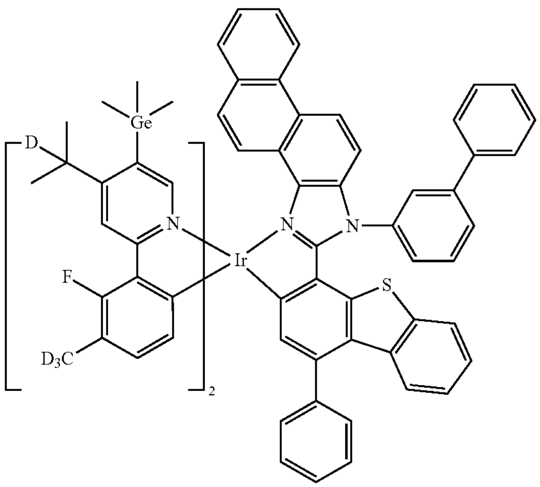
3080
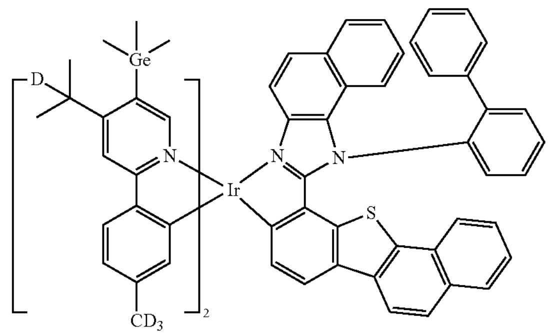
3081
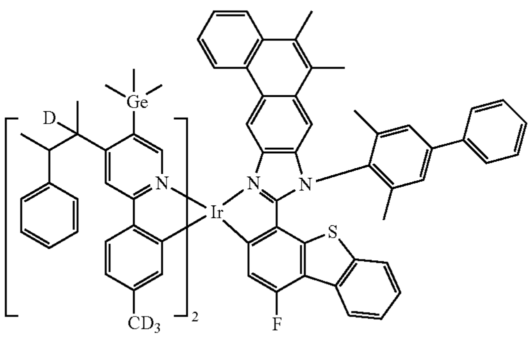
3082
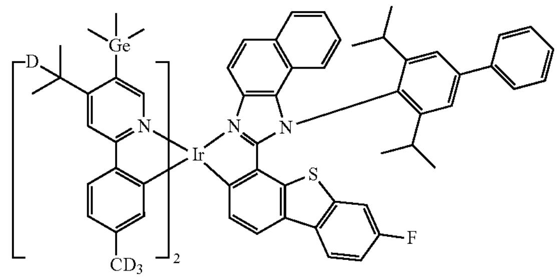
3083
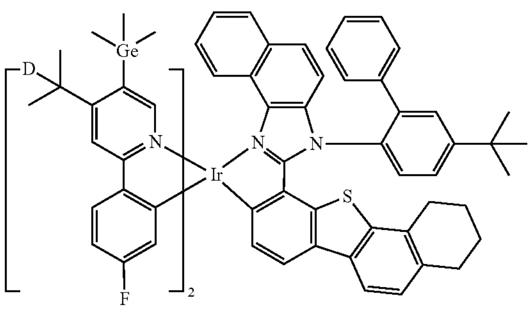
3084
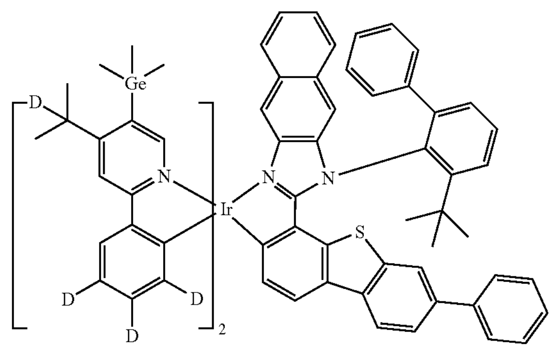
3085
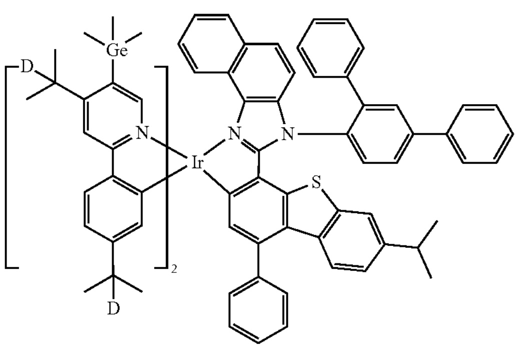
3086
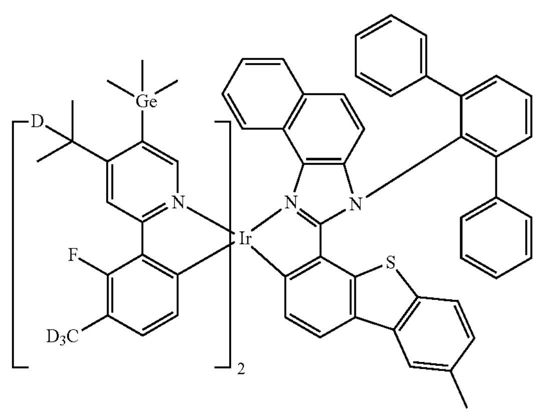

-continued
3087
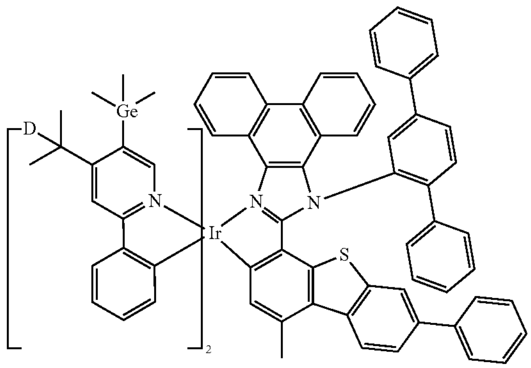
3088
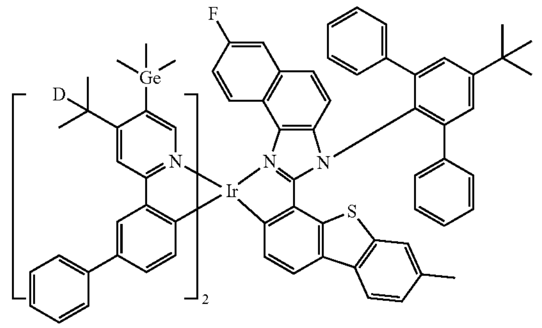
3089
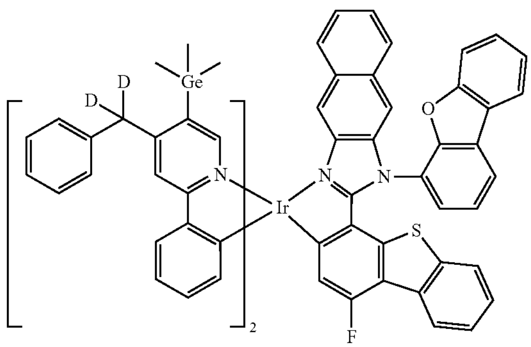
3090
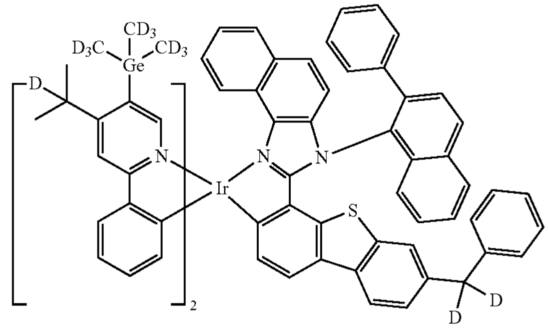
3091
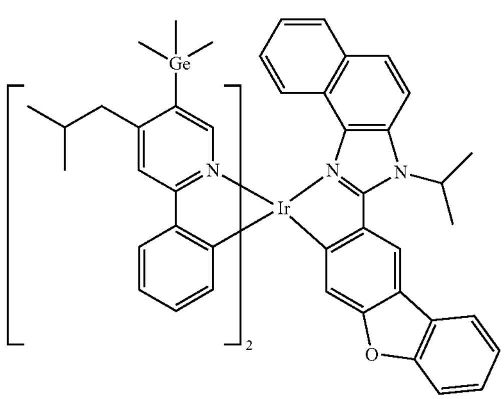
3092
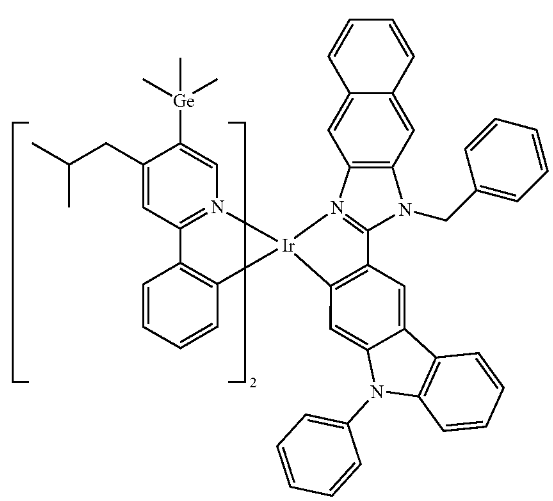

-continued
3093
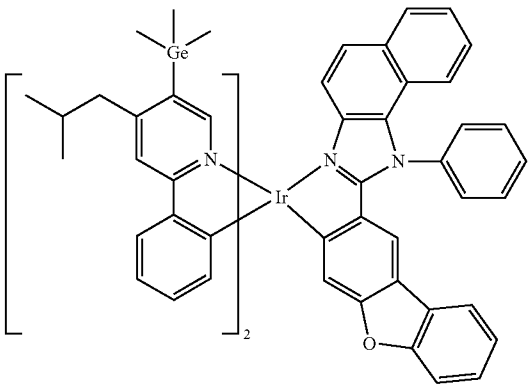
3094
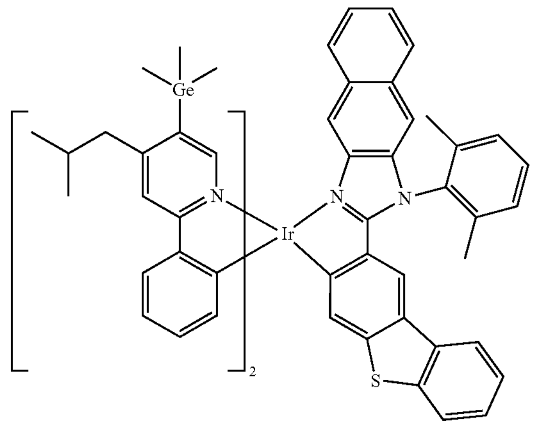
3095
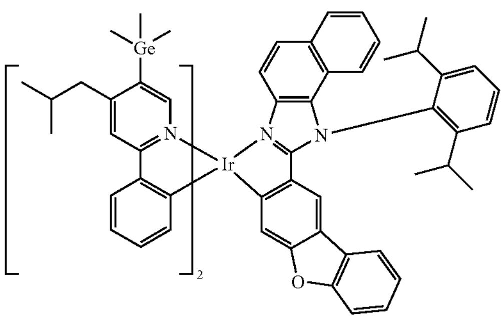
3096
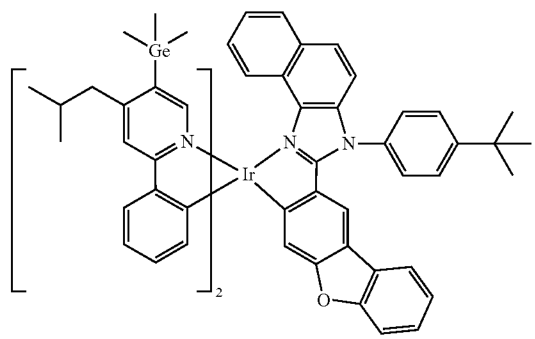
3097
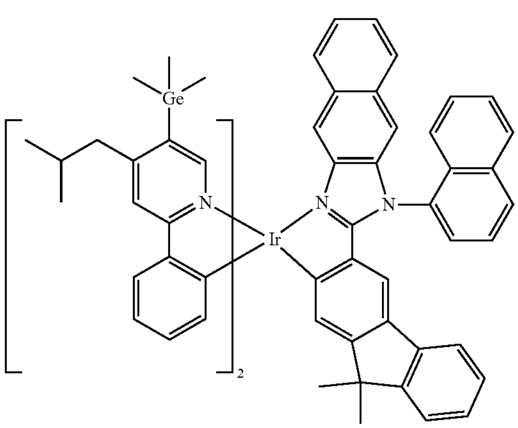
3098
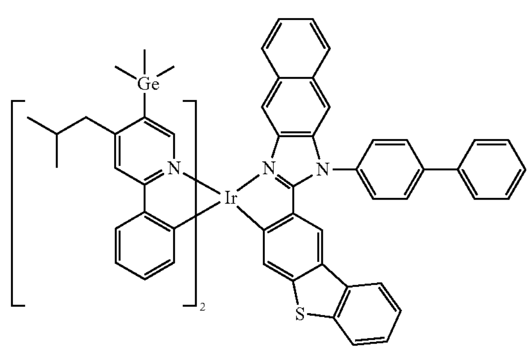

-continued
3099
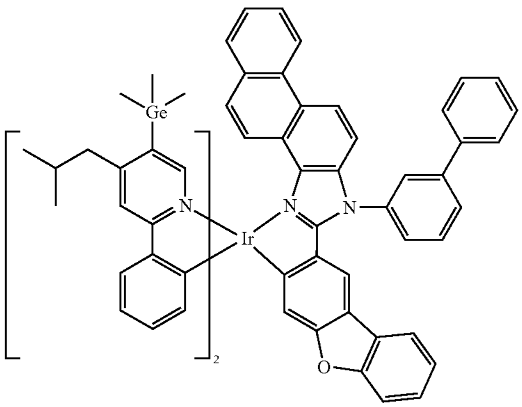
3100
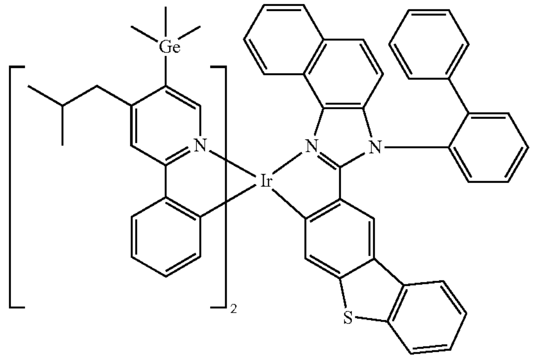
3101
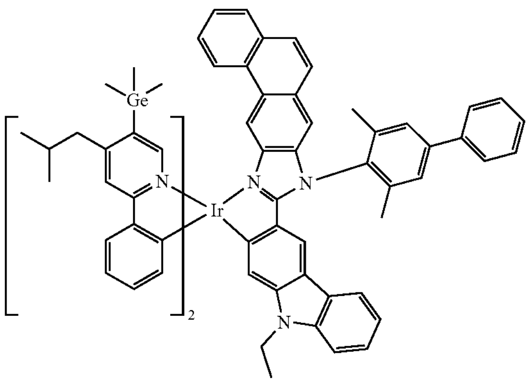
3102
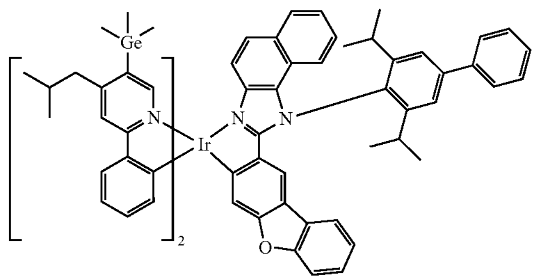
3103
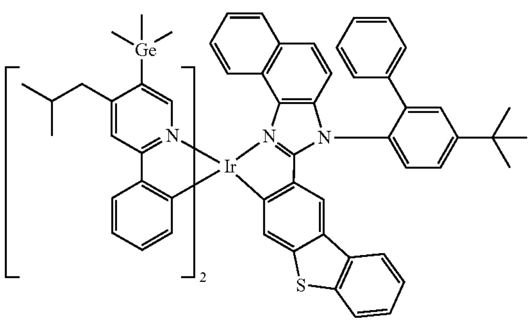
3104
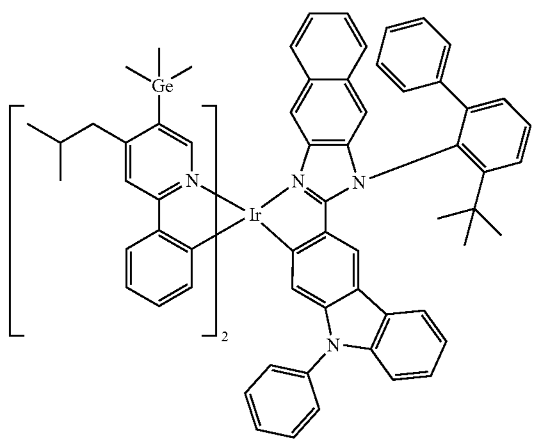
3105
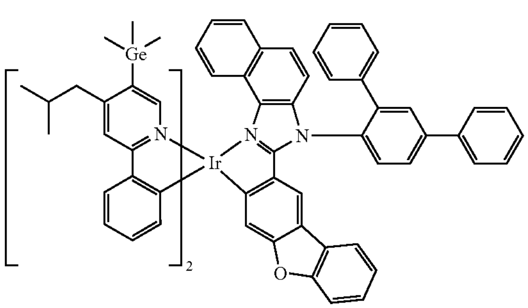
3106
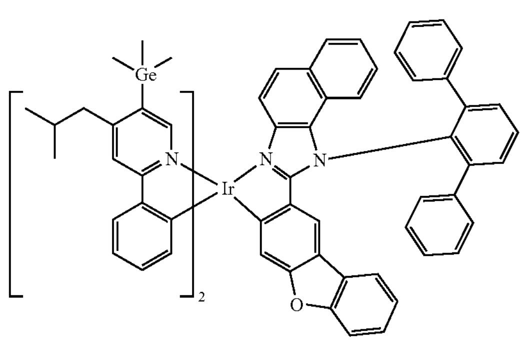

-continued
3107
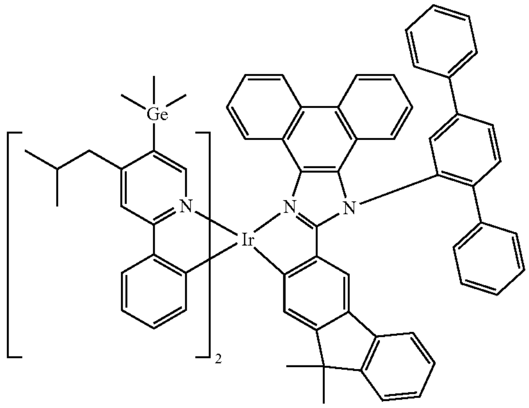
3108
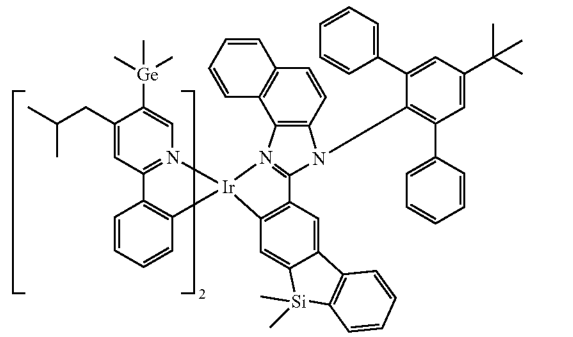
3109
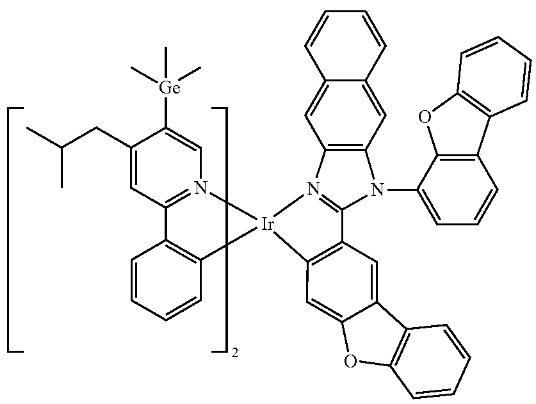
3110
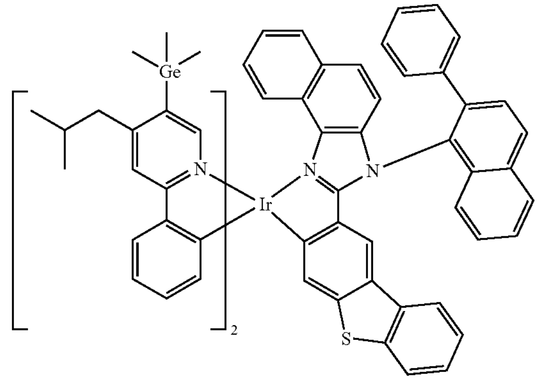
-continued
3111
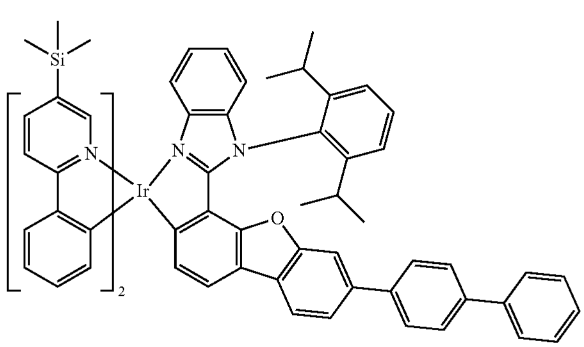
3112
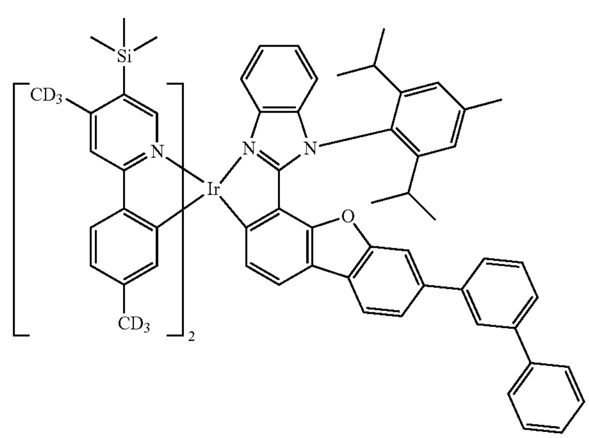

3113
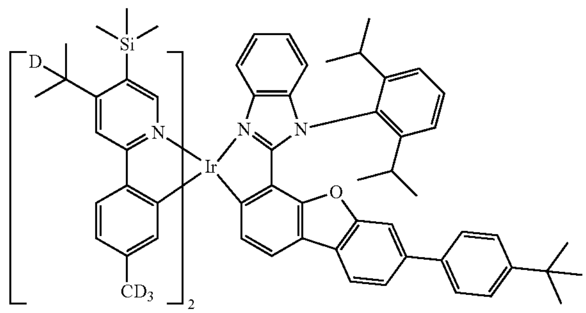
3114
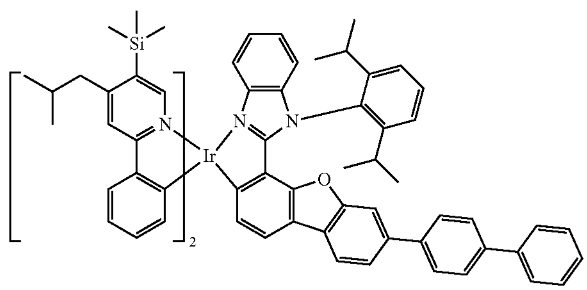
3115
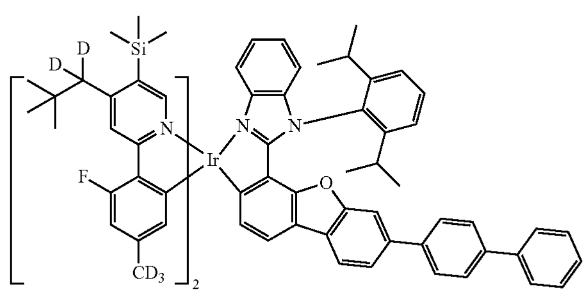
3116
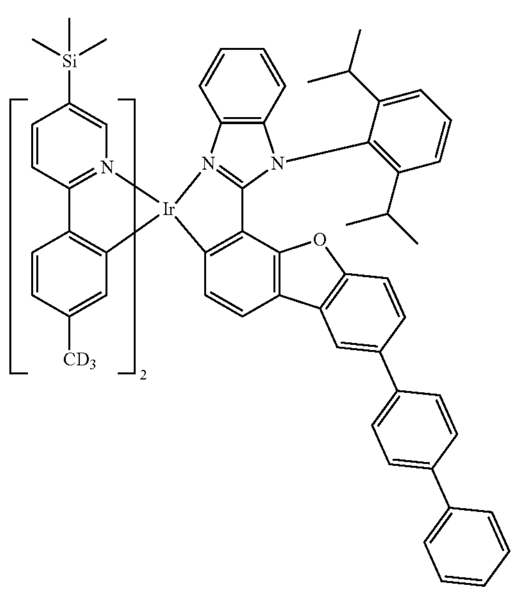
3117
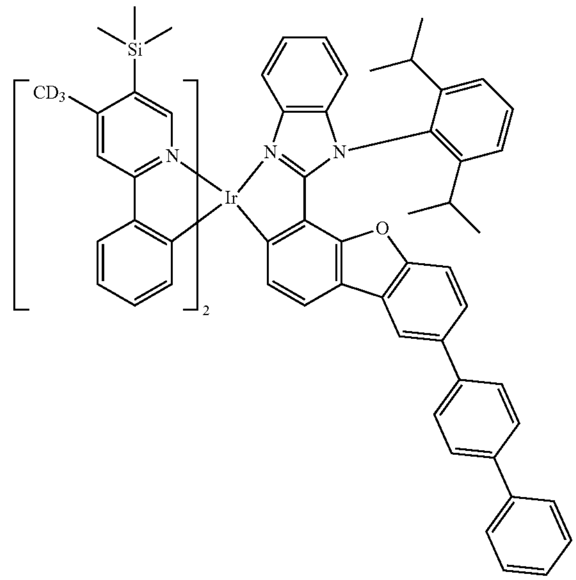
3118
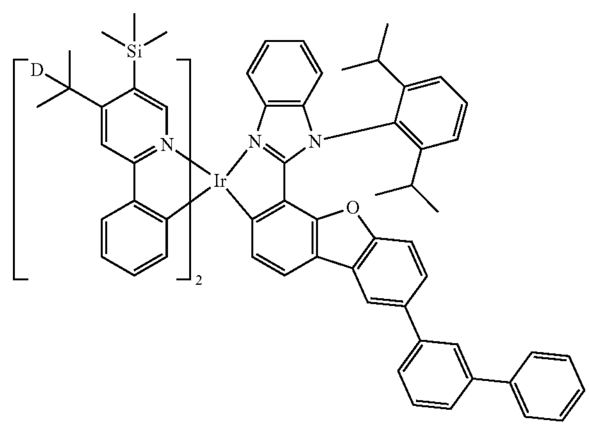
3119
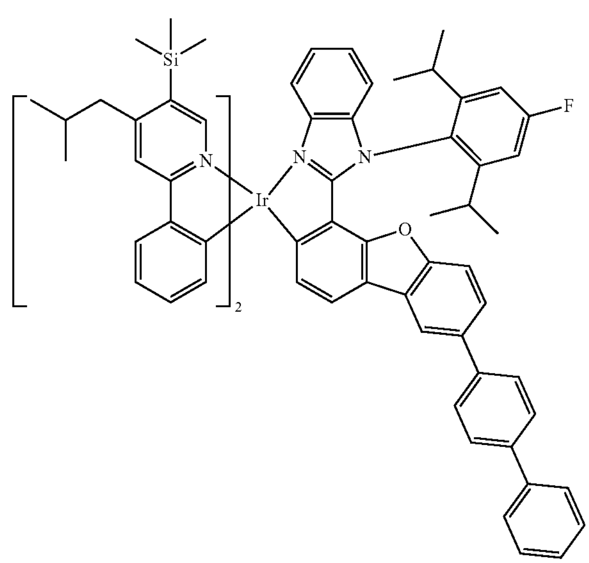

-continued
3120
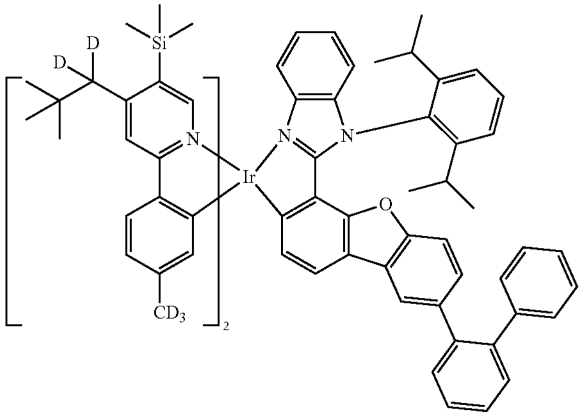
3121
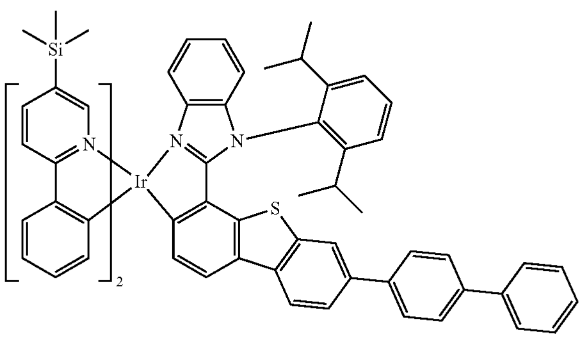
3122
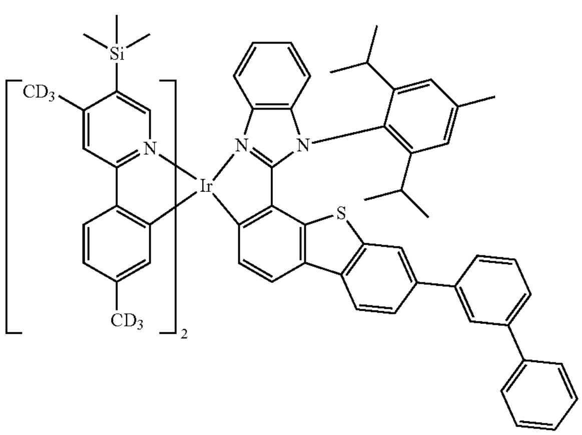
3123
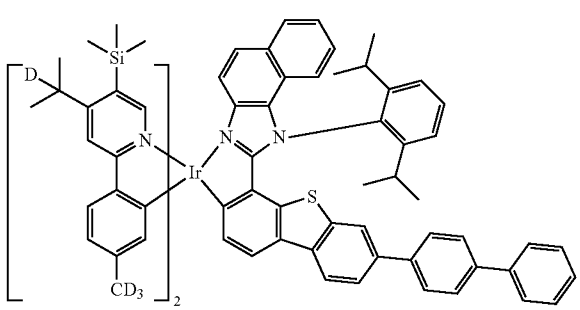
-continued
3124
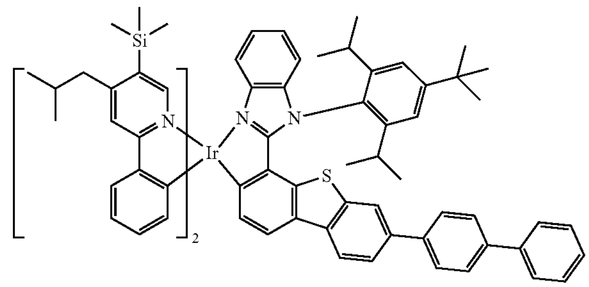
3125
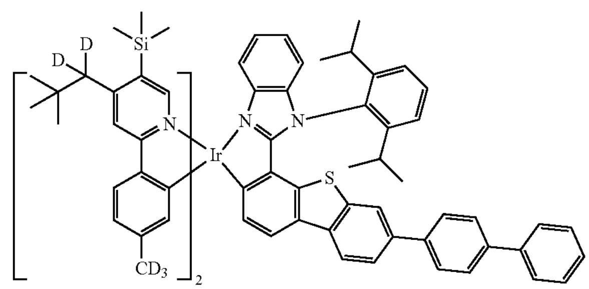
3126
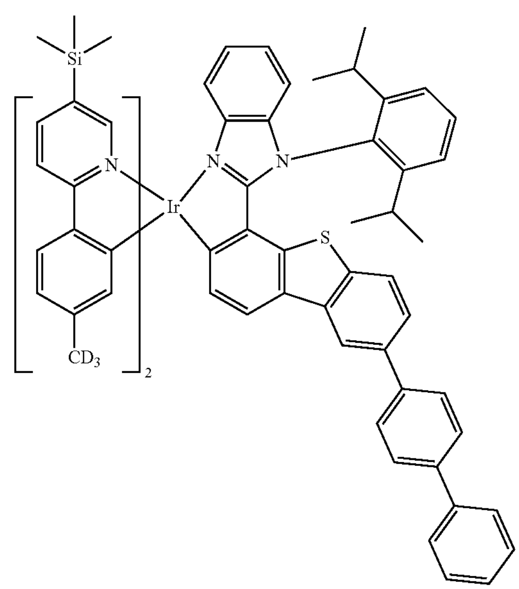

-continued
3127
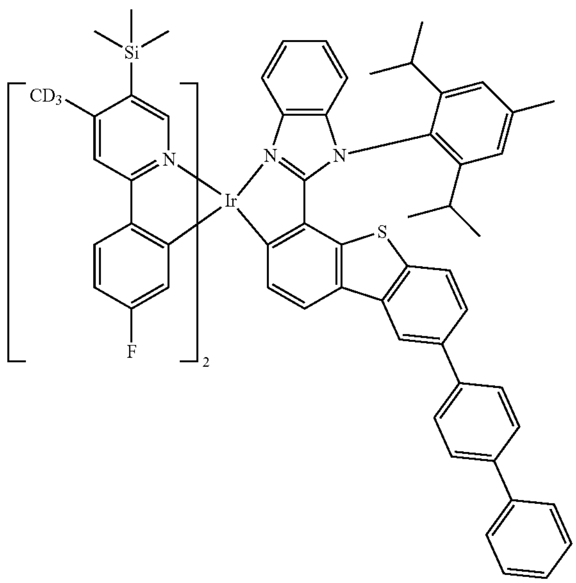
3128
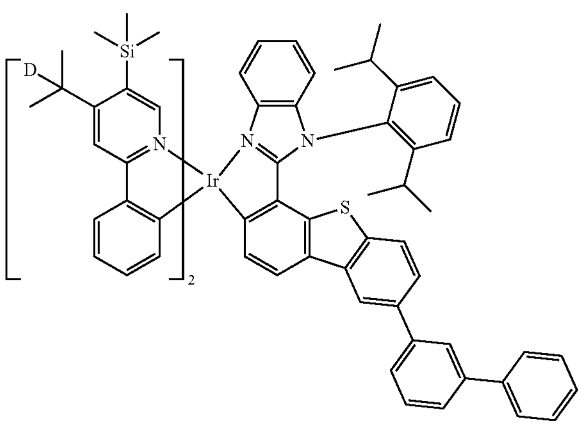
3129
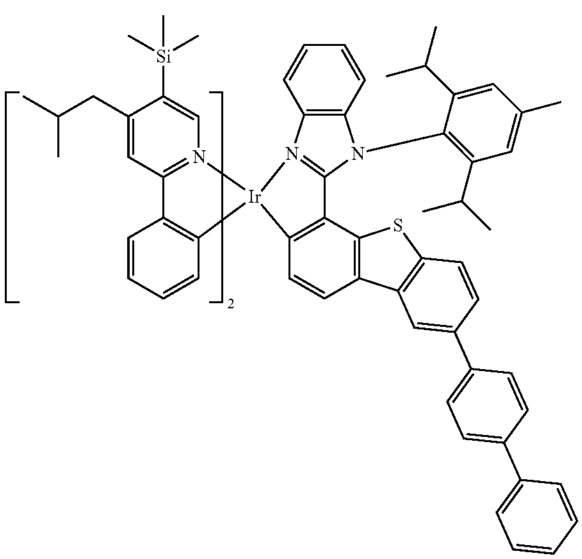
-continued
3130
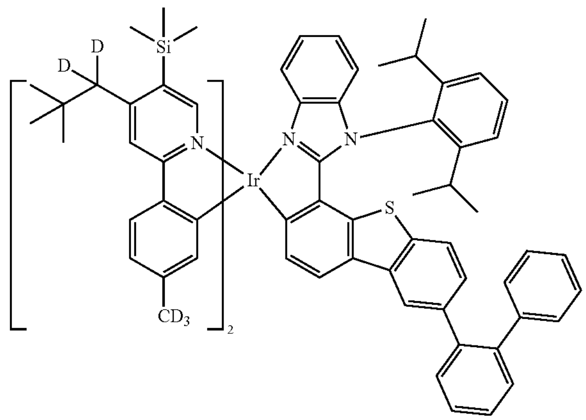
3131
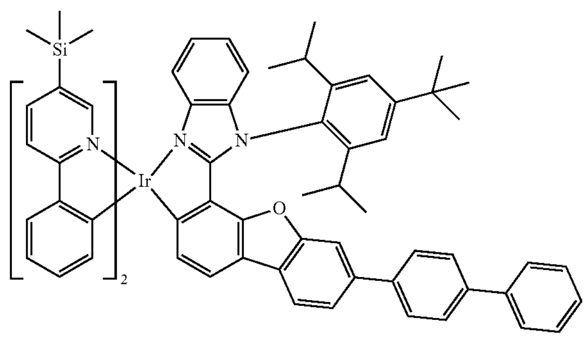
3132
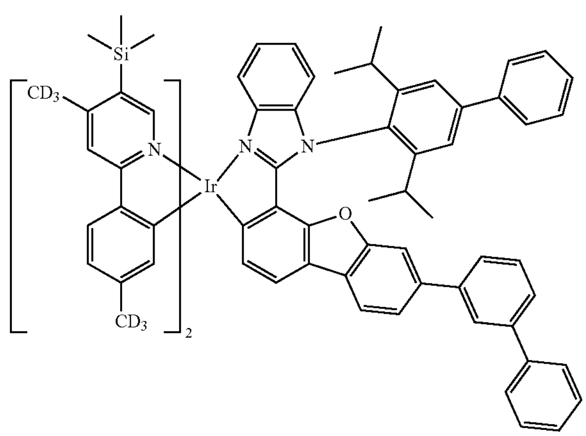
3133
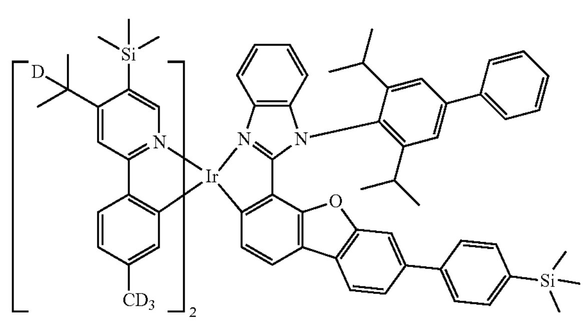

-continued
3134
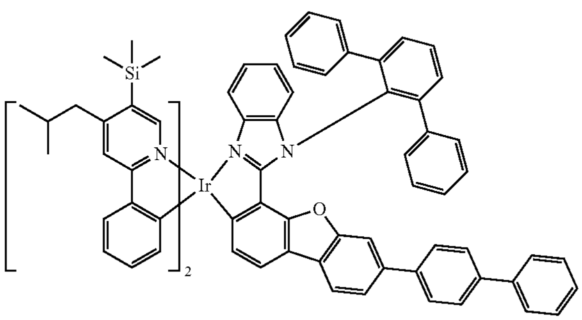
3135
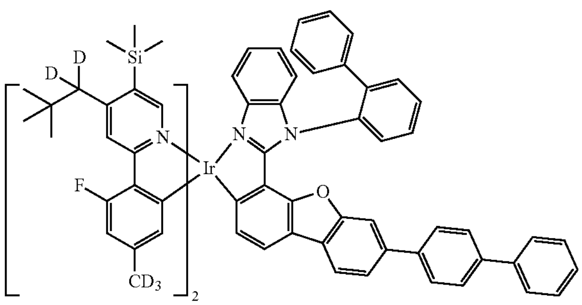
3136
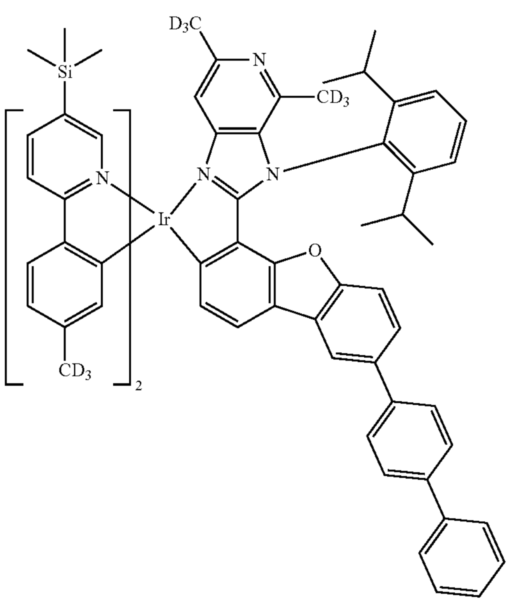
-continued
3137
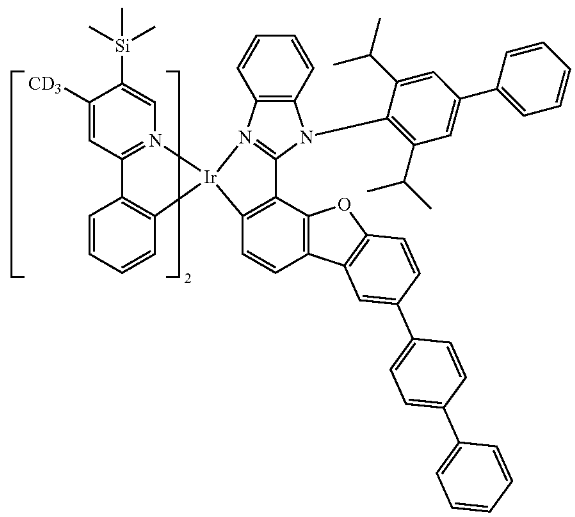
3138
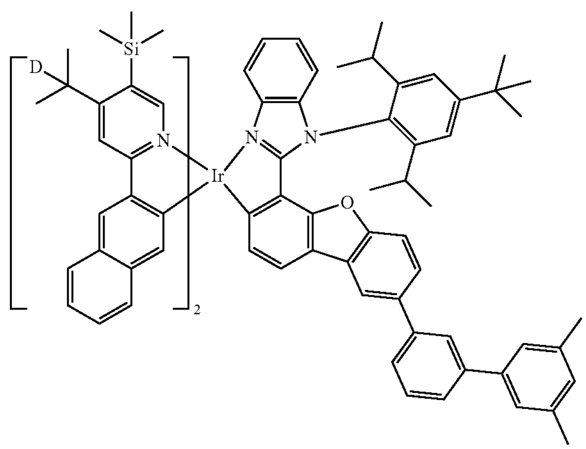
3139
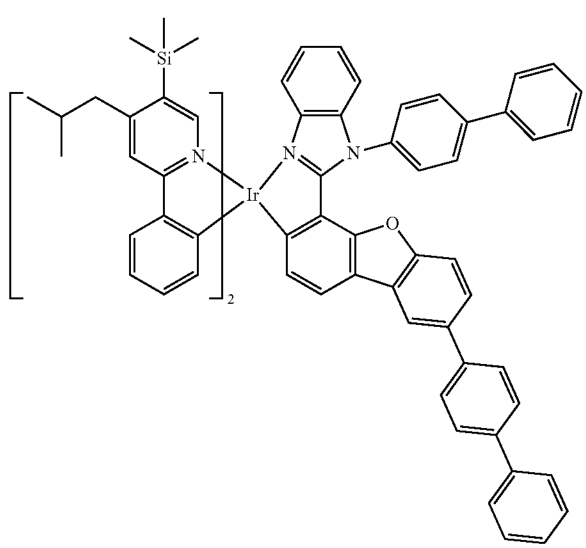

-continued
3140
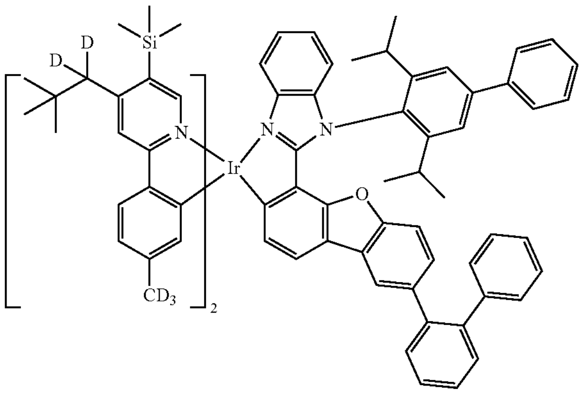
3141
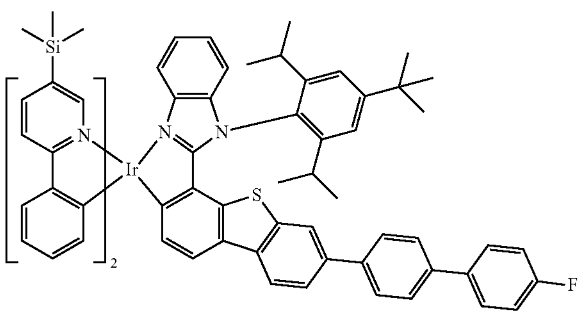
3142
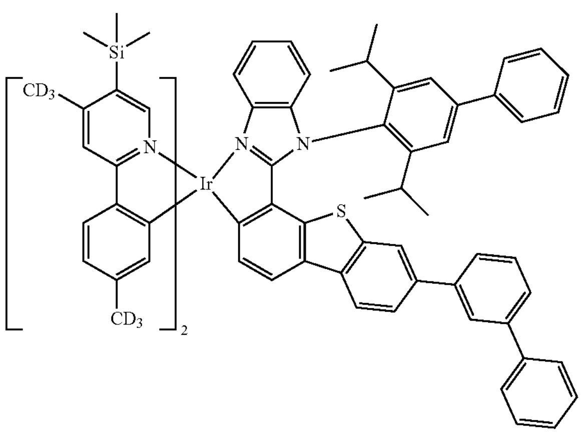
3143
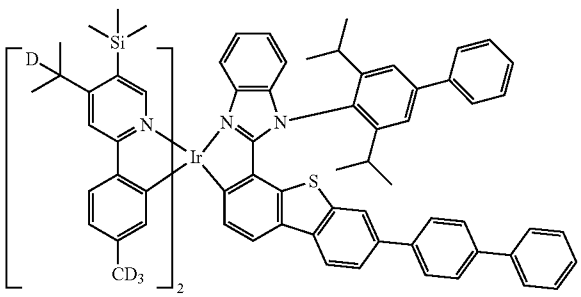
-continued
3144
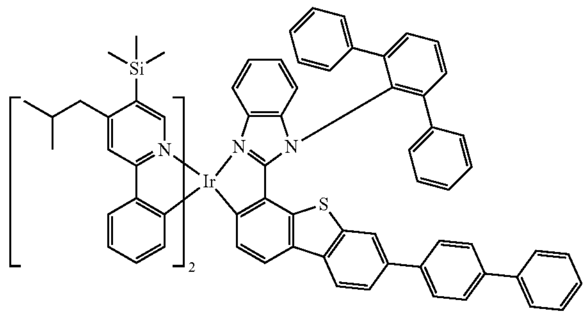
3145
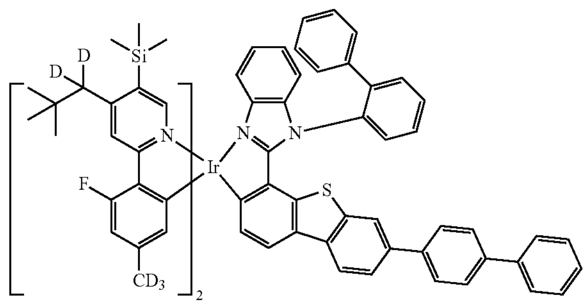
3146
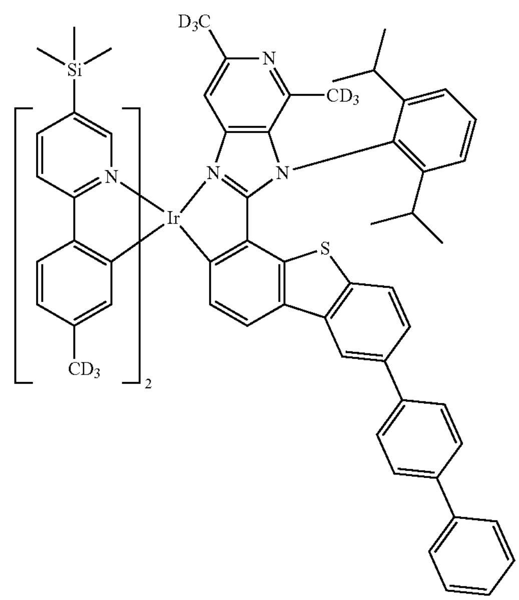

3147
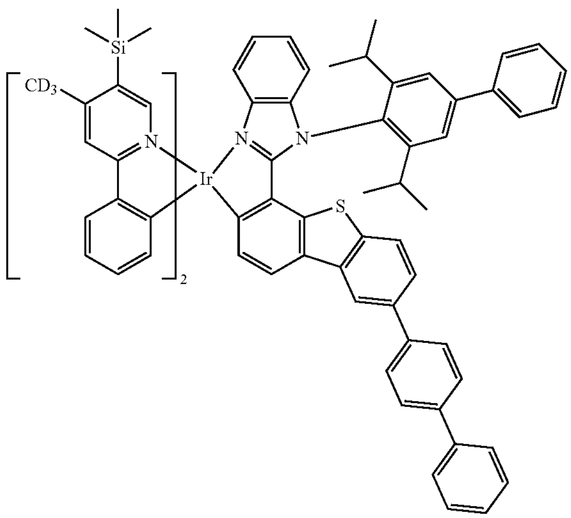
3148
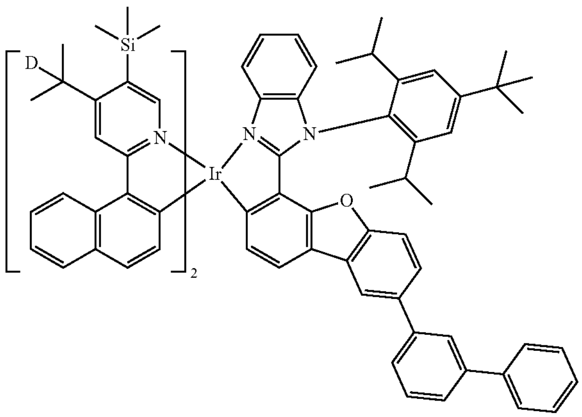
3149
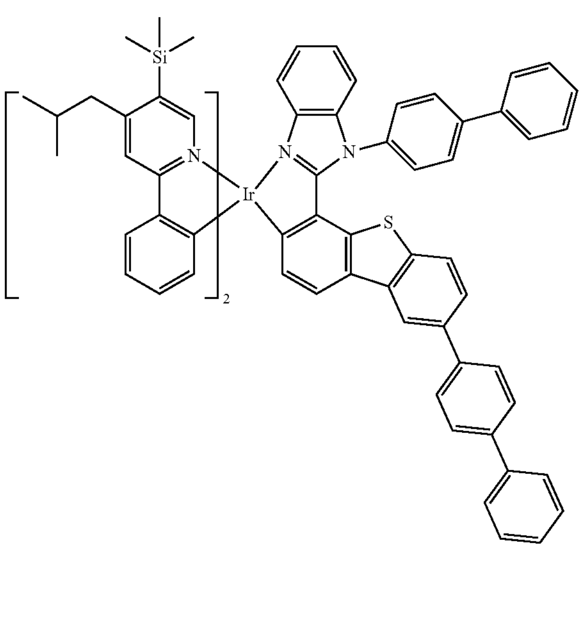
3150
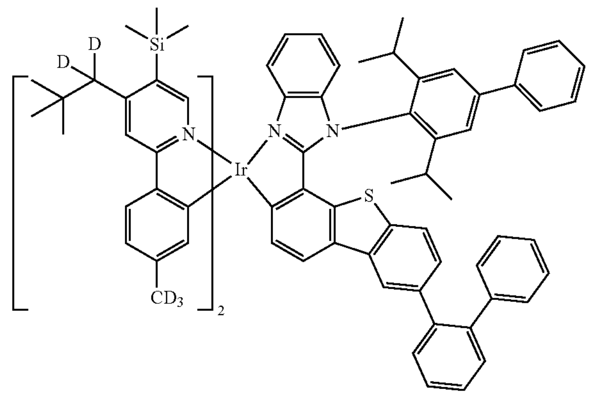
3151
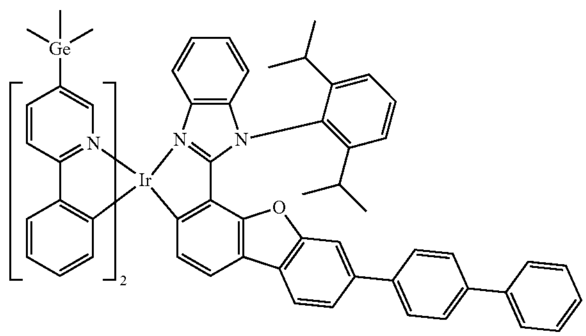
3152
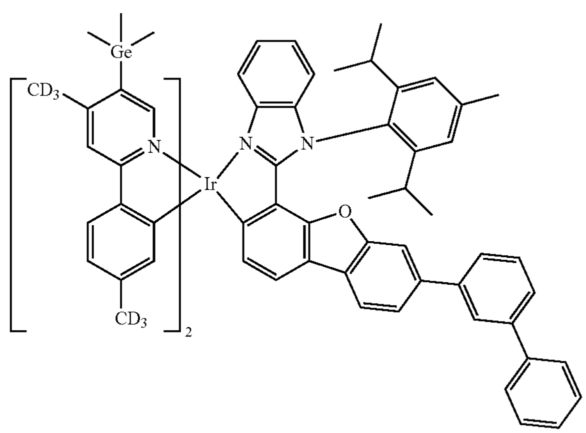
3153
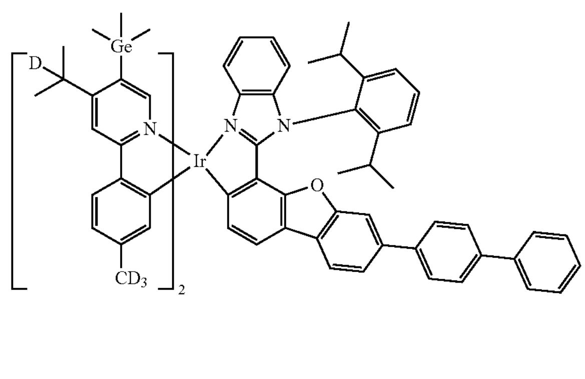

3154
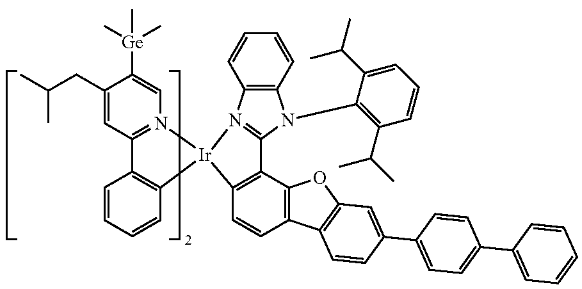
3155
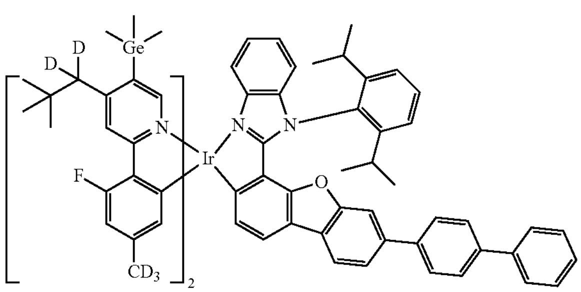
3156
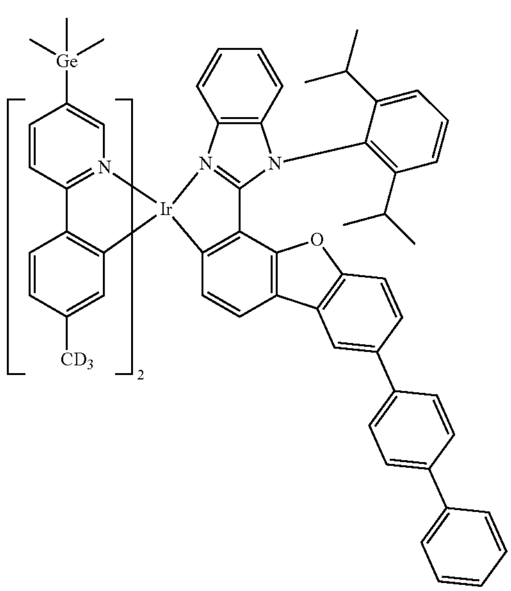
3157
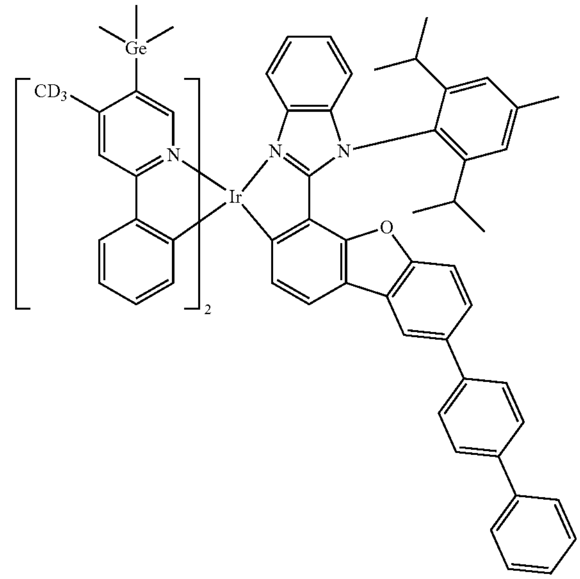
3158
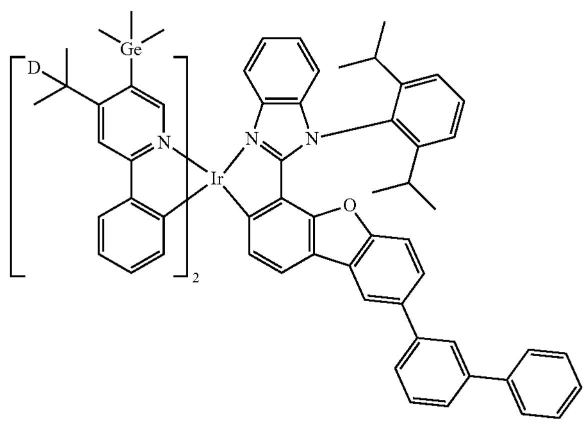
3159
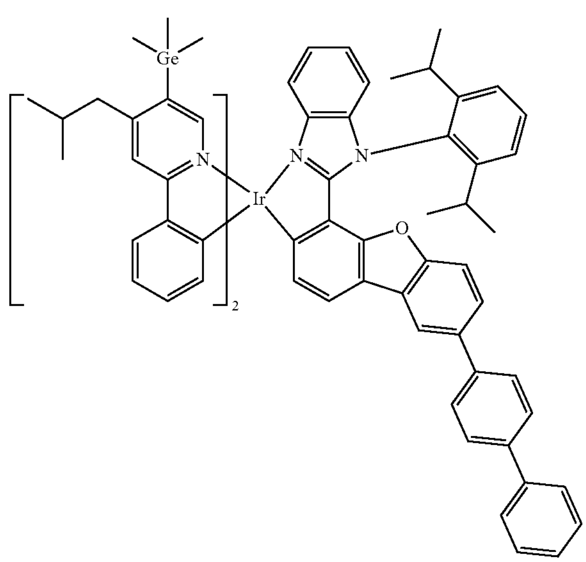

-continued
3160
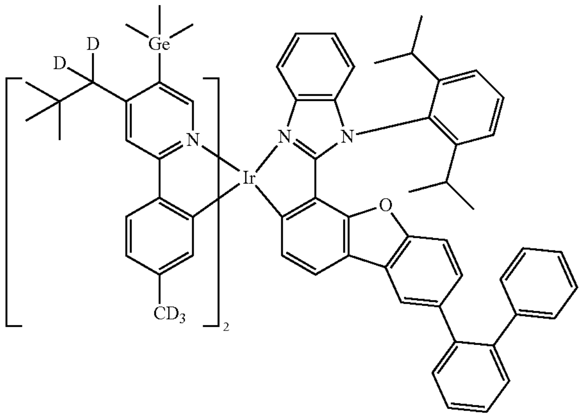
3161
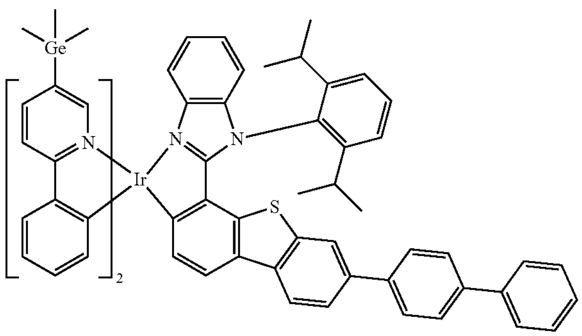
3162
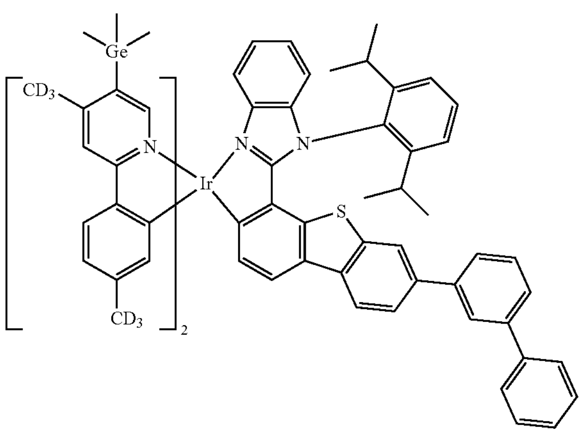
3163
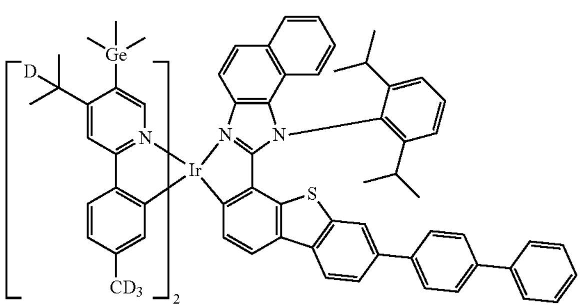
-continued
3164
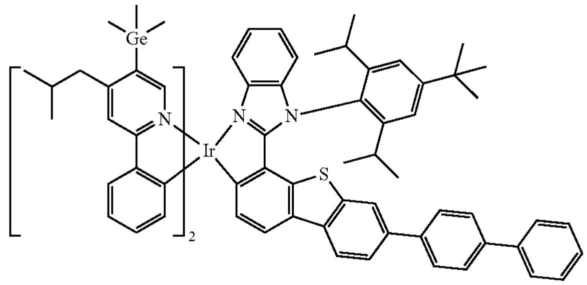
3165
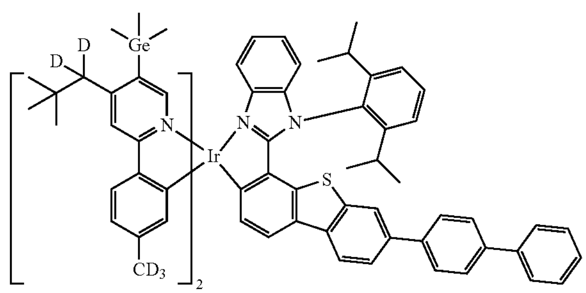
3166
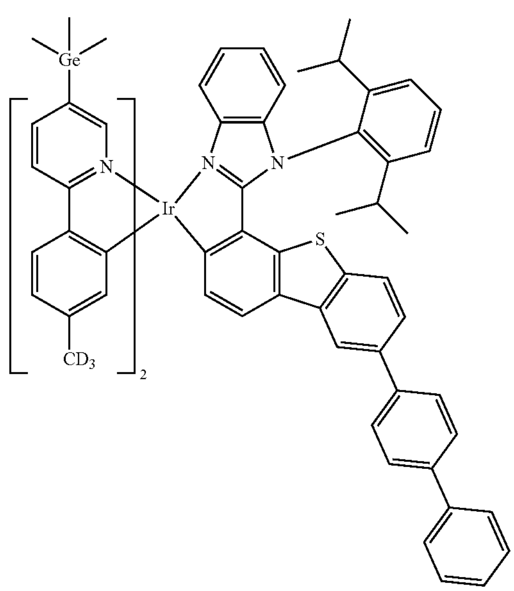

-continued
3167
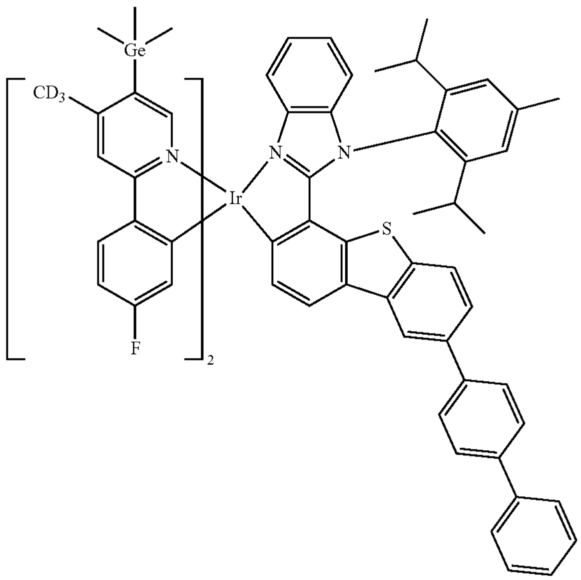
3168
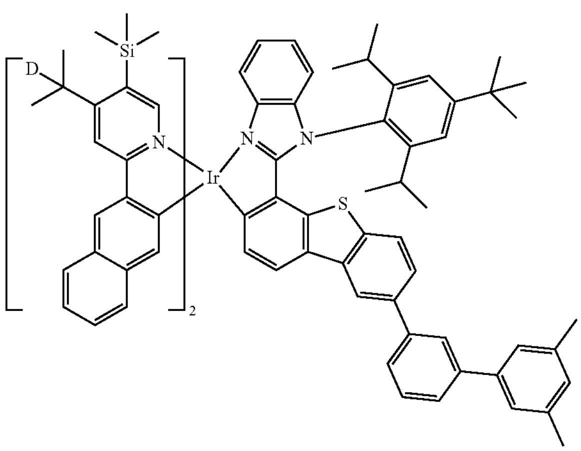
3169
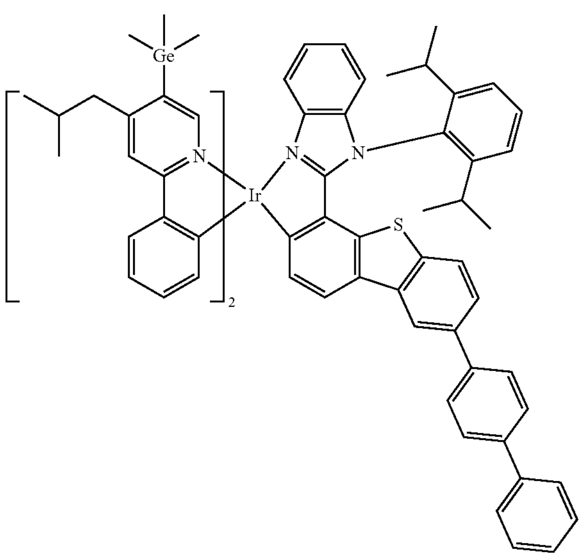
-continued
3170
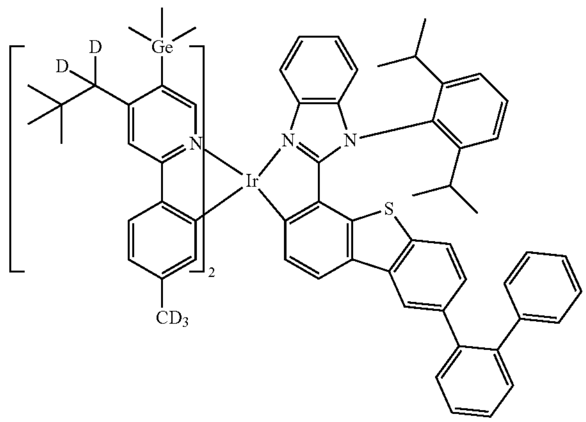
3171
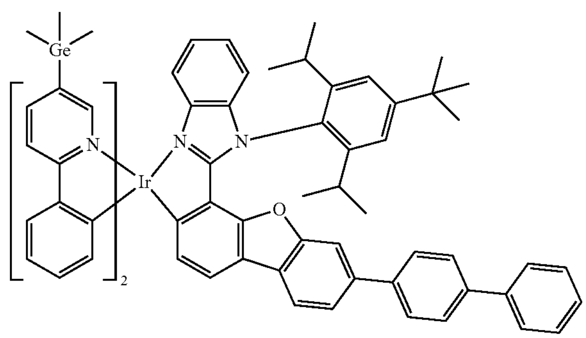
3172
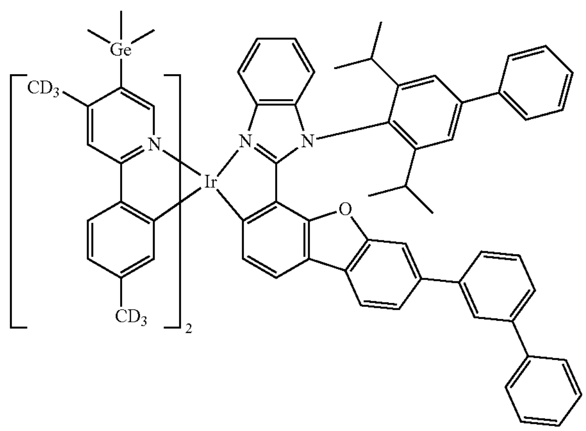
3173
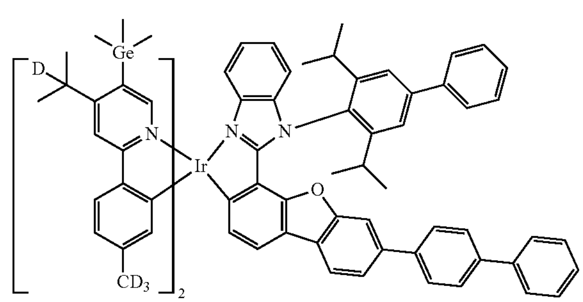

-continued
3174
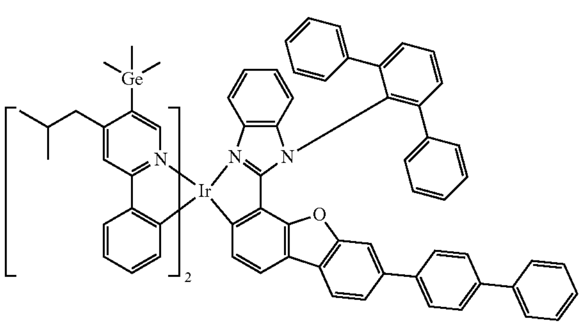
3175
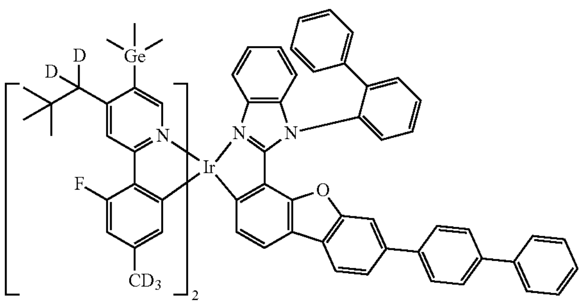
3176
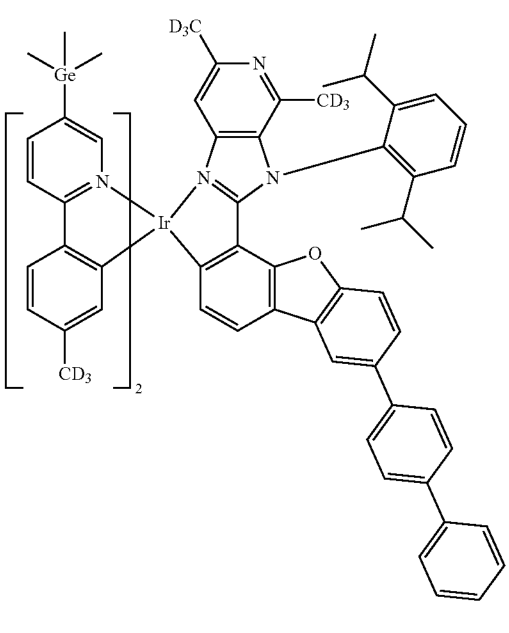
-continued
3177
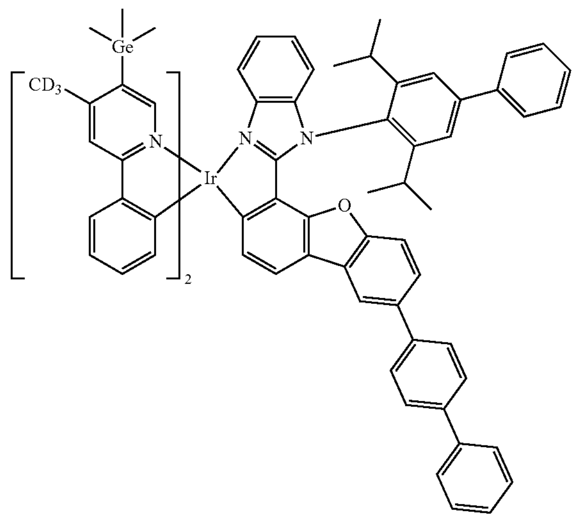
3178
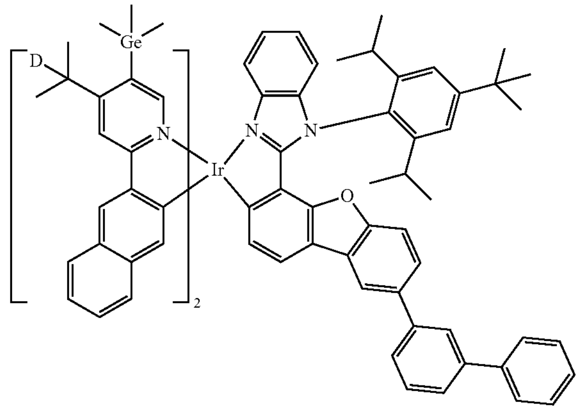
3179
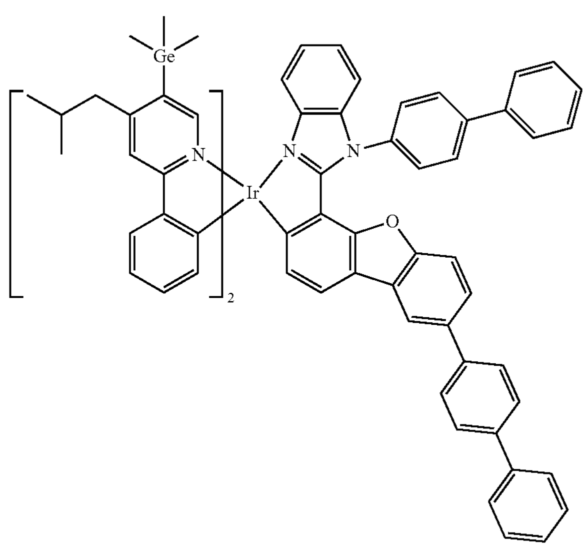

-continued
3180
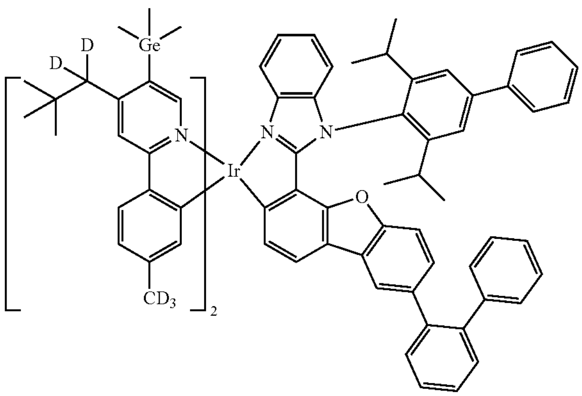
3181
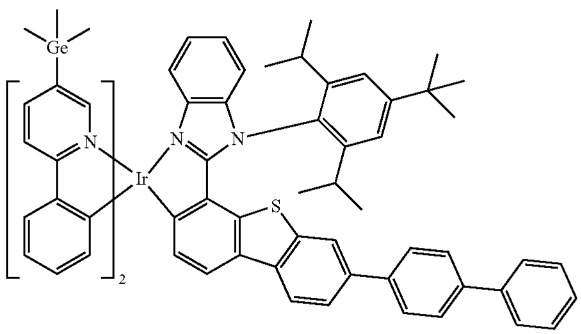
3182
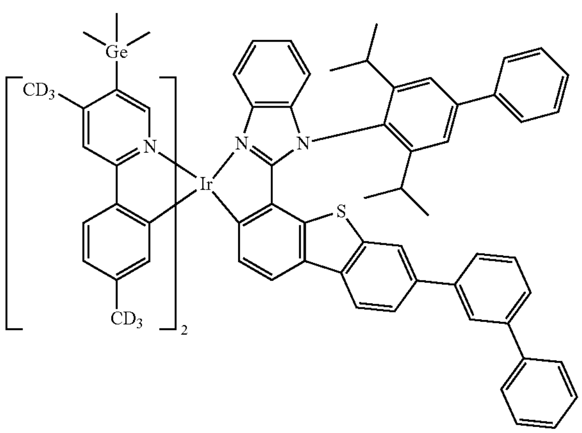
3183
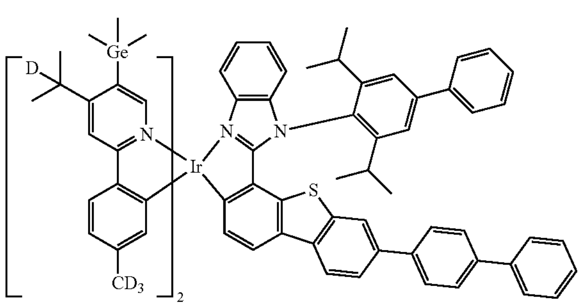
-continued
3184
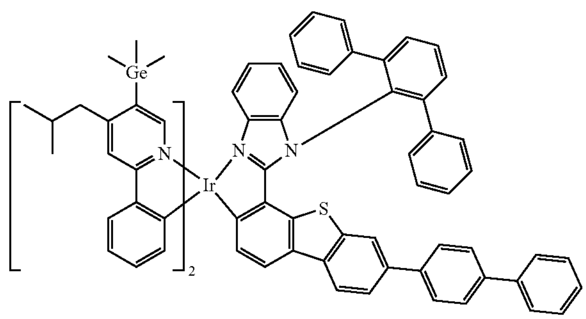
3185
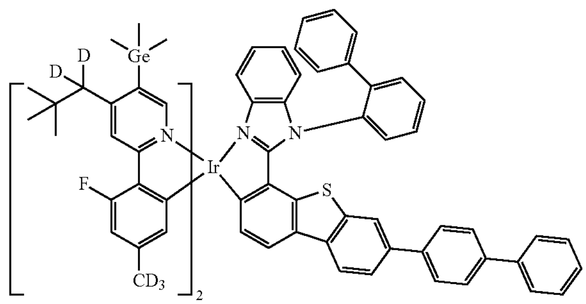
3186
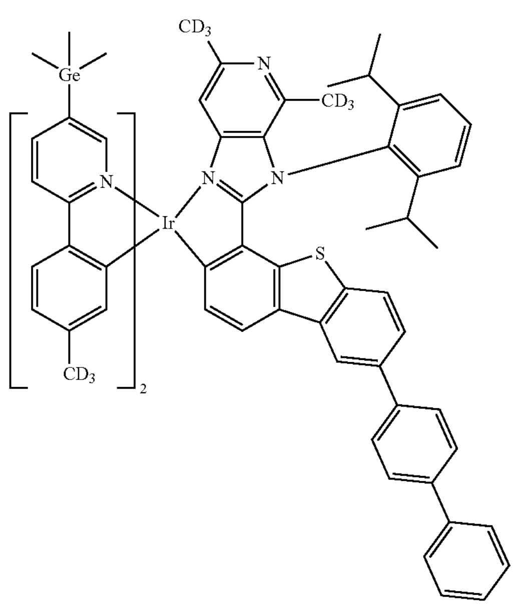

-continued
3187
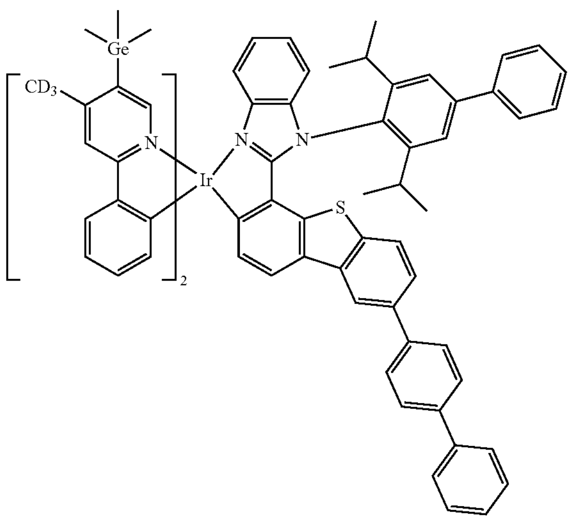
3188
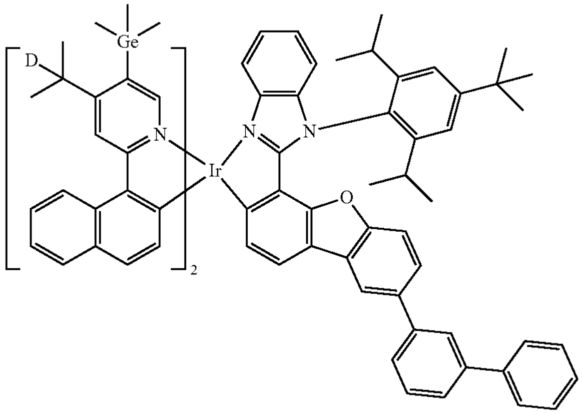
3189
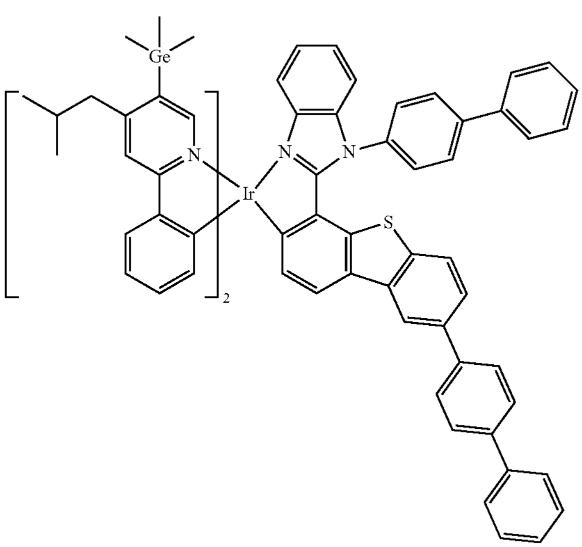
-continued
3190
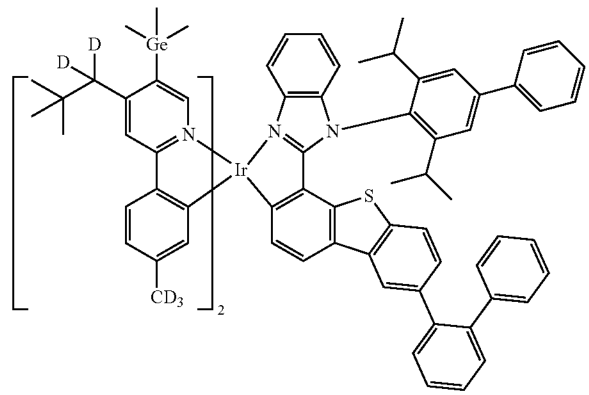
3191
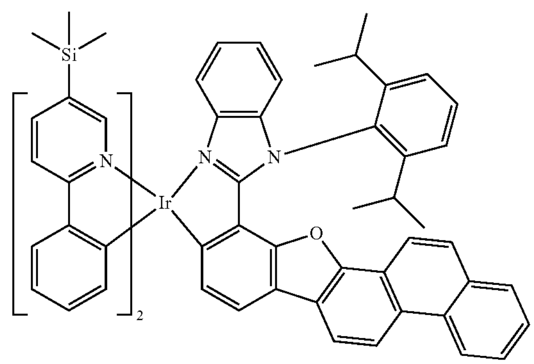
3192
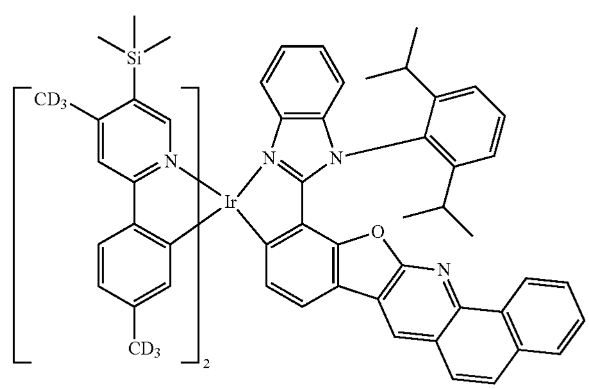
3193
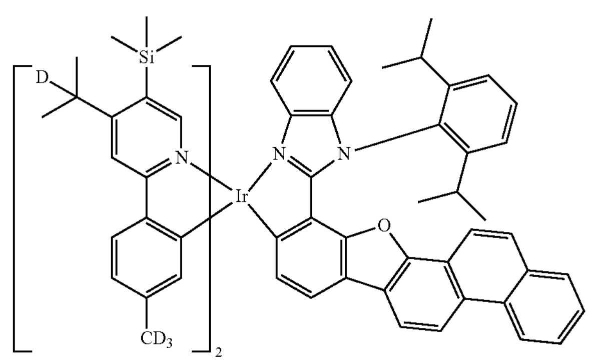

-continued
3194
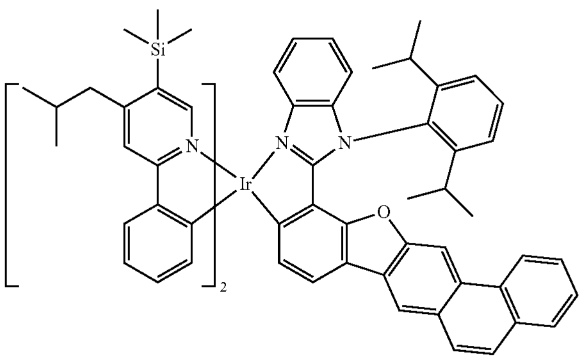
3195
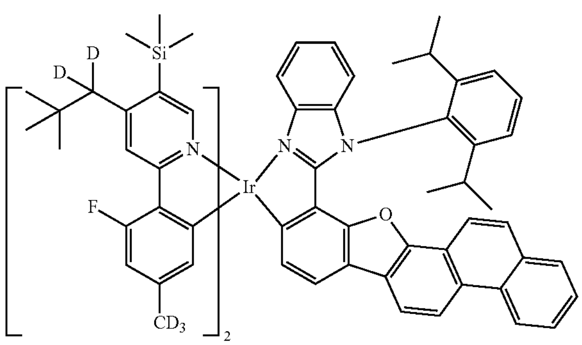
3196
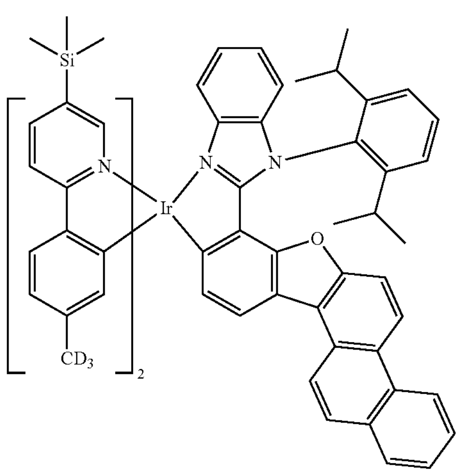
-continued
3197
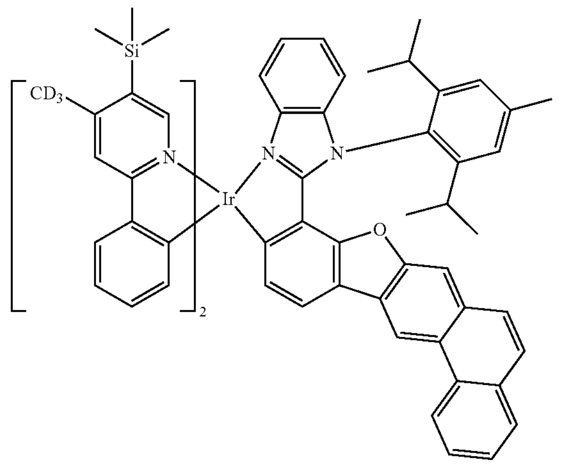
3198
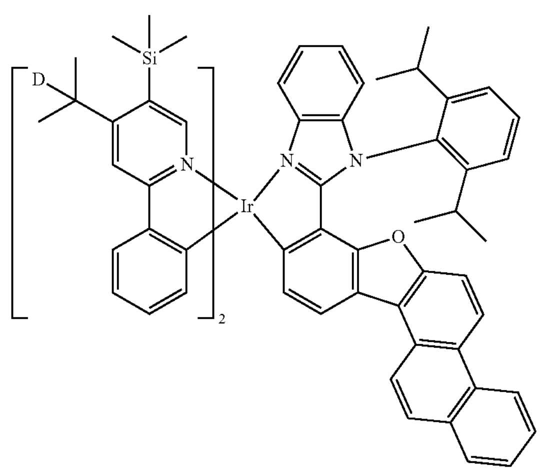
3199
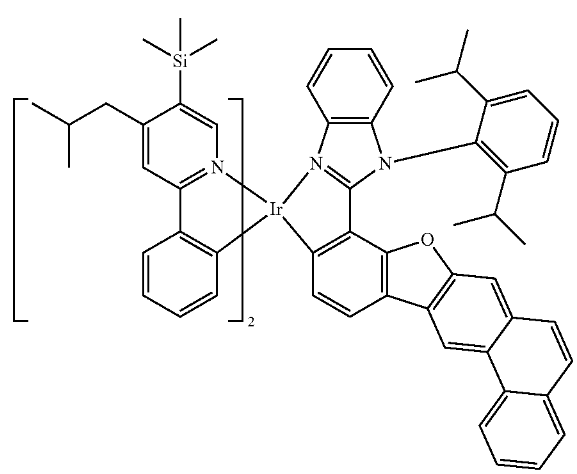

-continued
3200
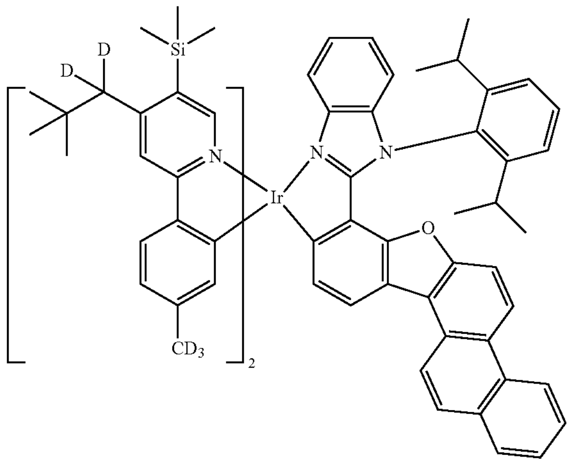
3201
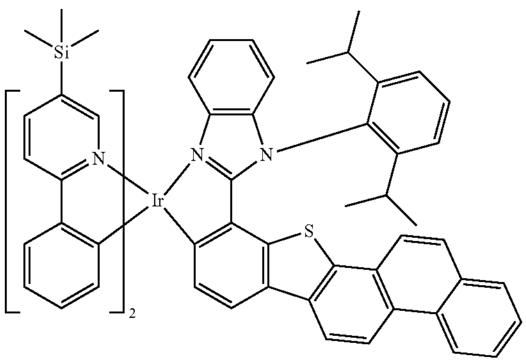
3202
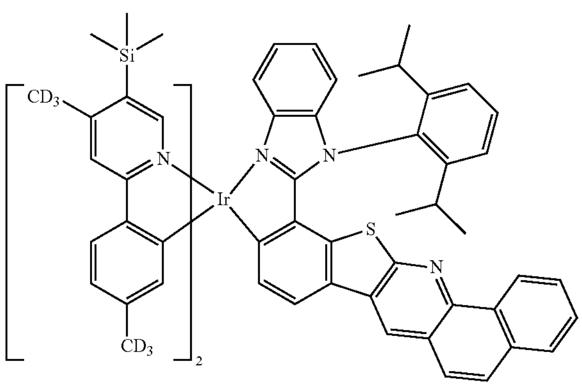
3203
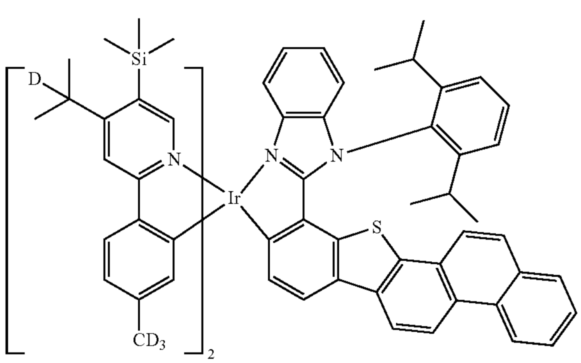
-continued
3204
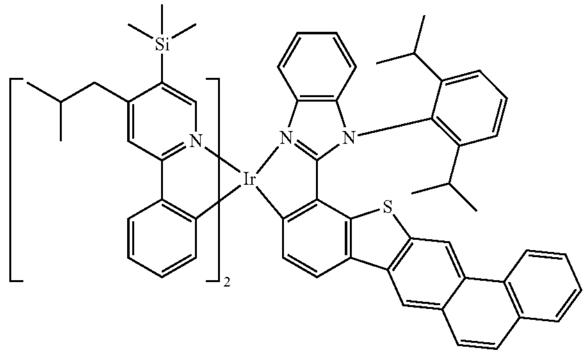
3205
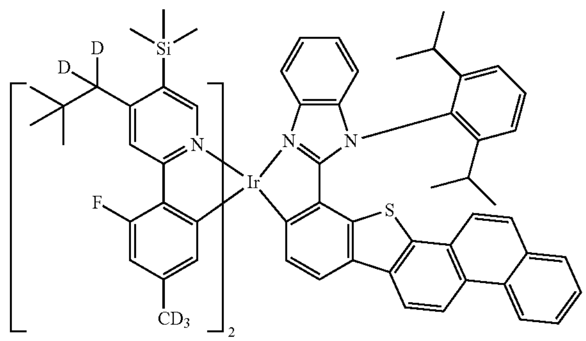
3206
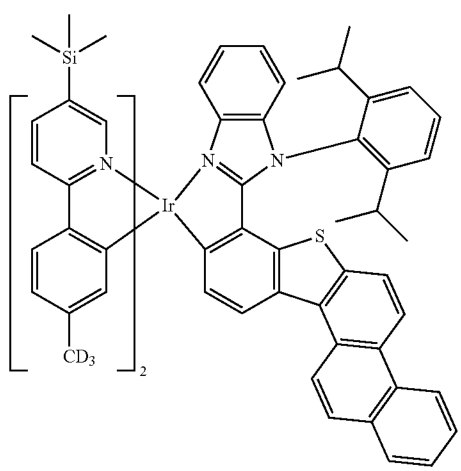

-continued
3207
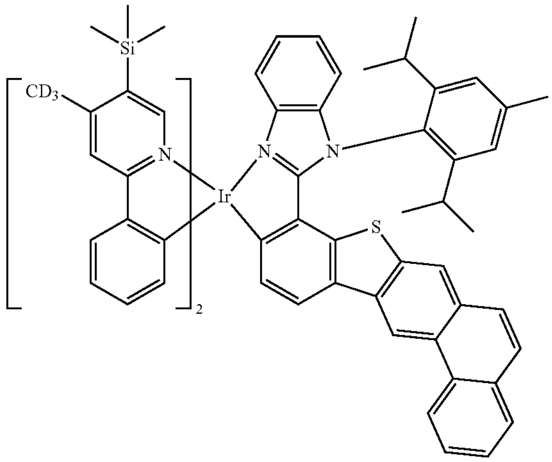
3208
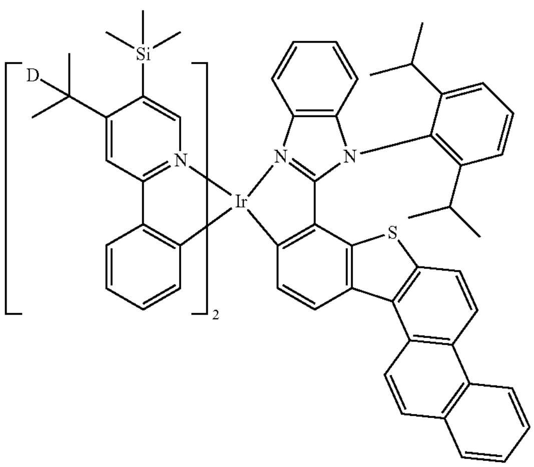
3209
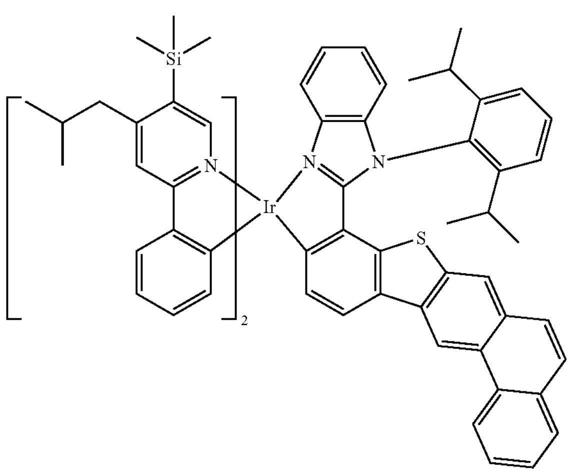
-continued
3210
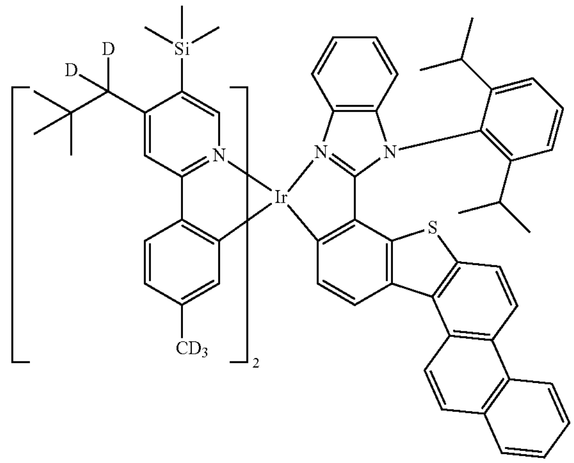
3211
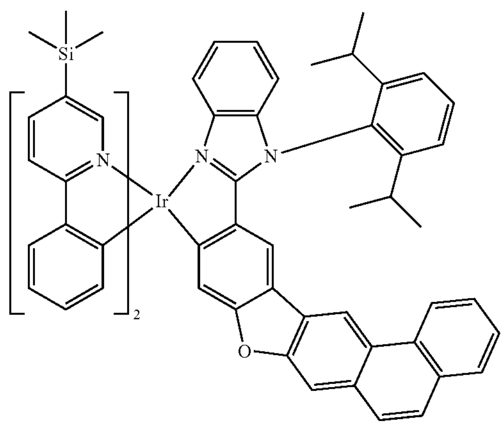
3212
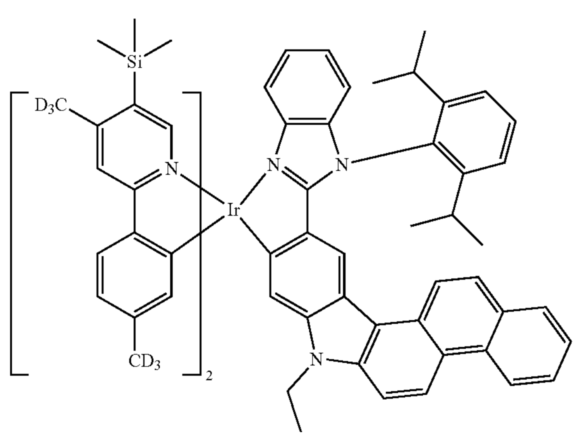

-continued
3213
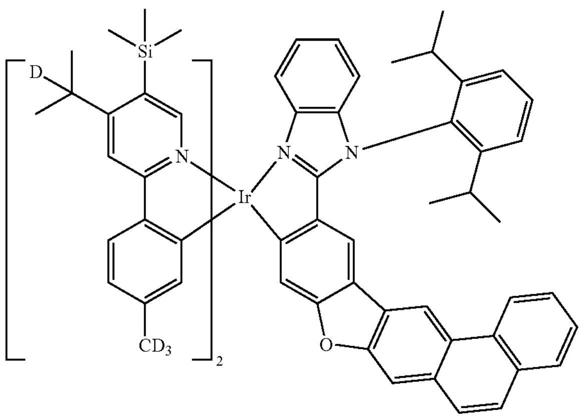
3214
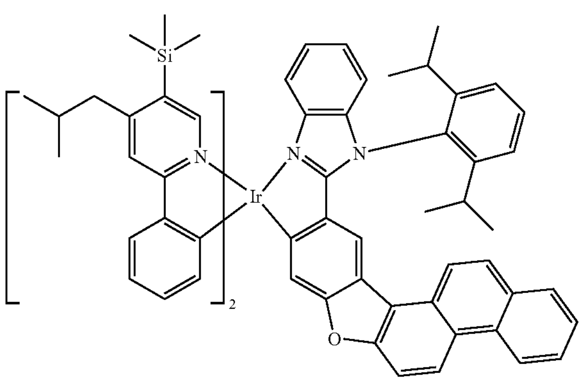
3215
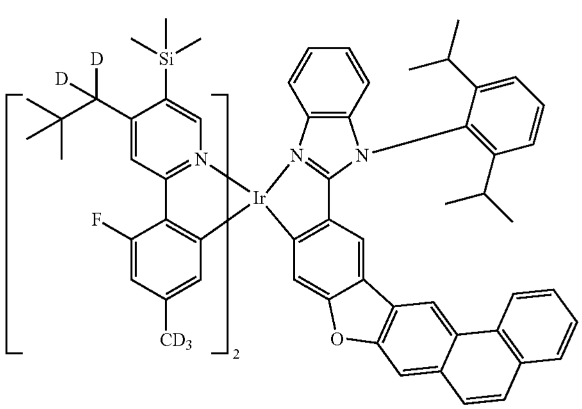
-continued
3216
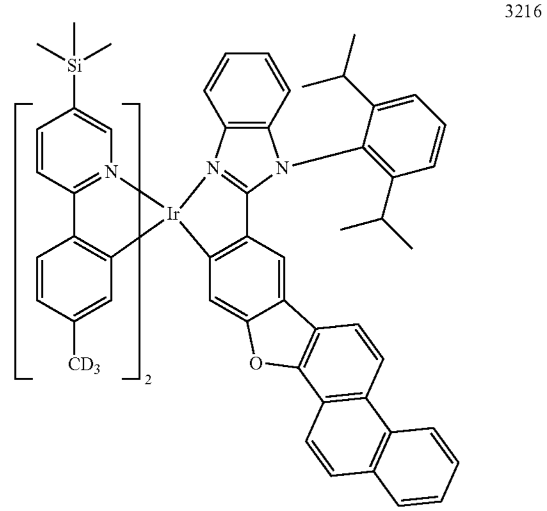
3217
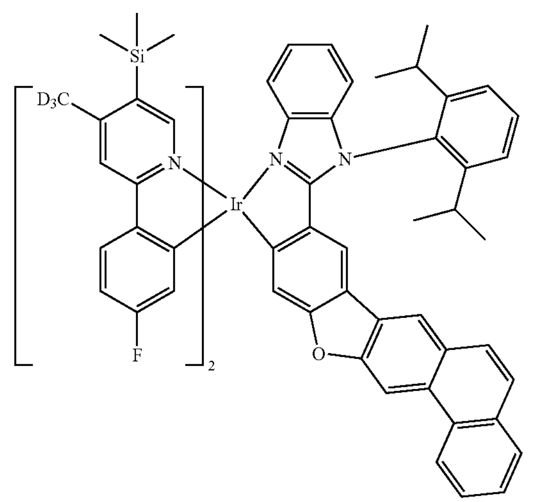
3218
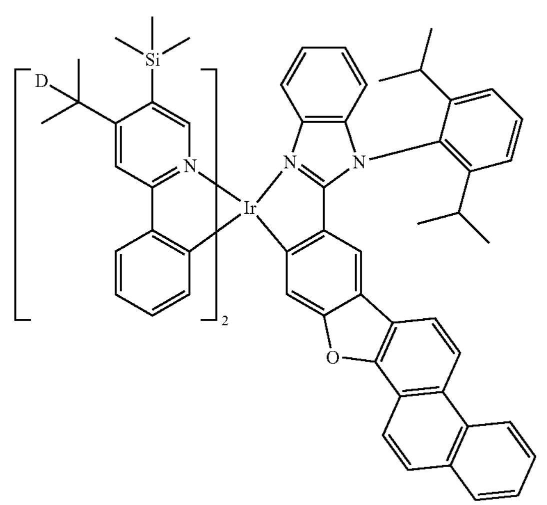

-continued
3219
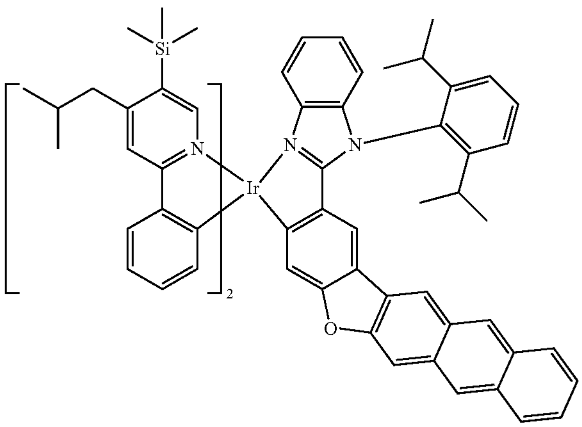
3220
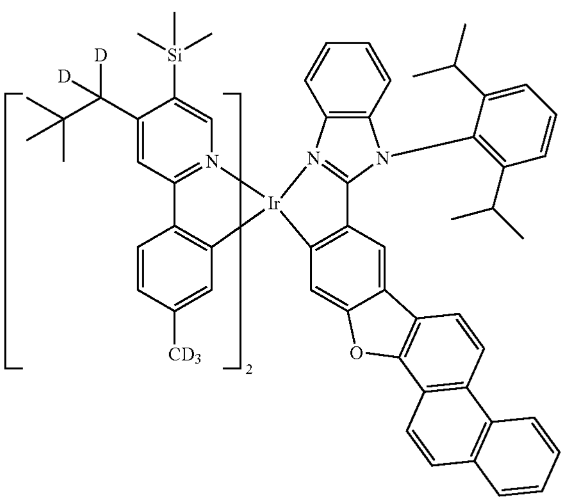
3221
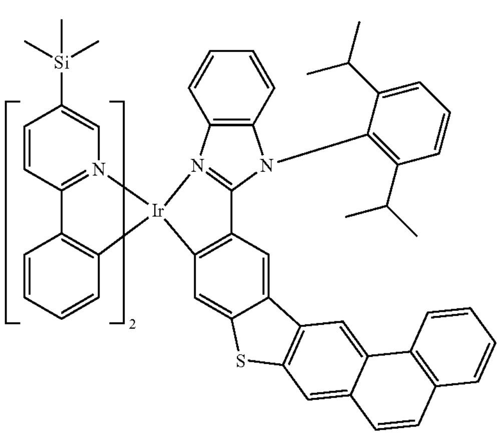
-continued
3222
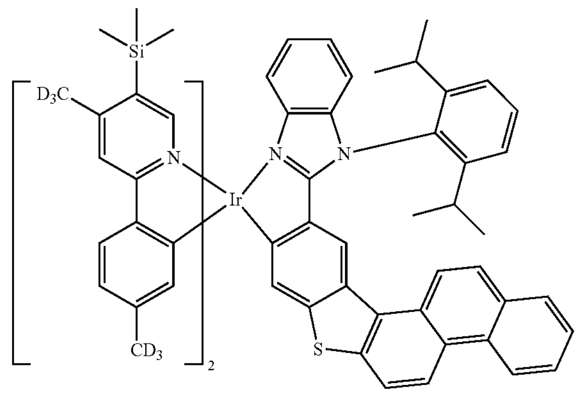
3223
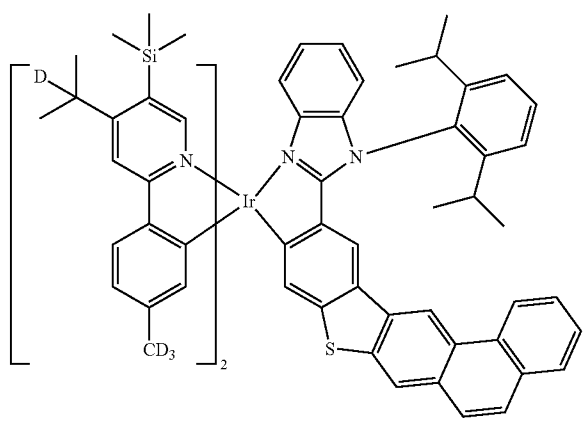
3224
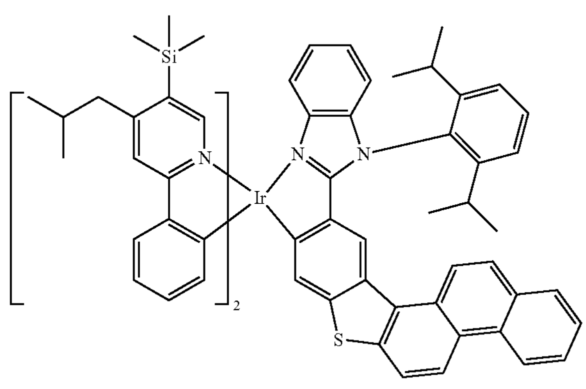

-continued
3225
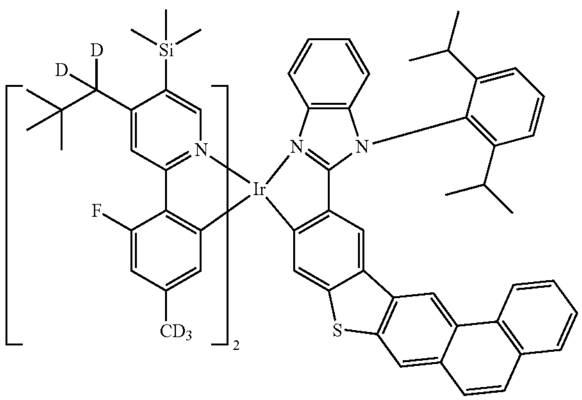
3226
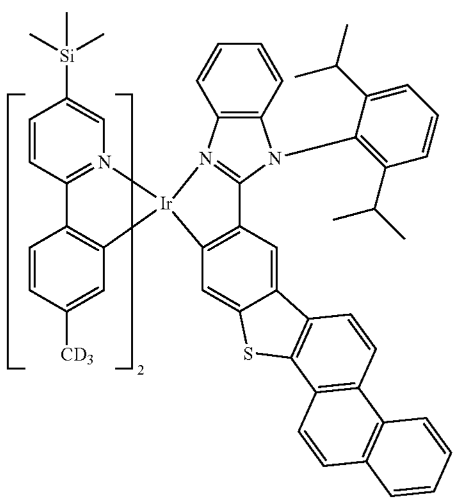
3227
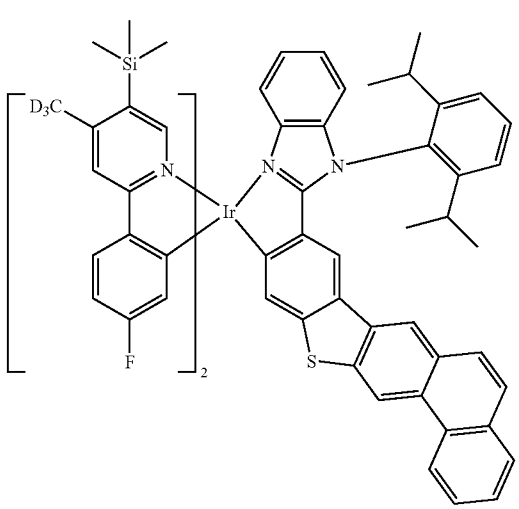
-continued
3228
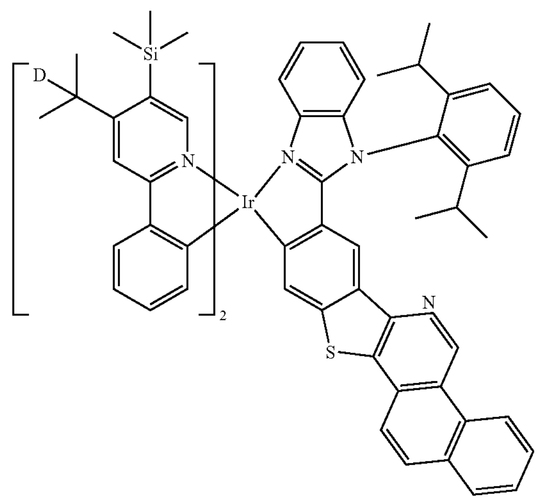
3229
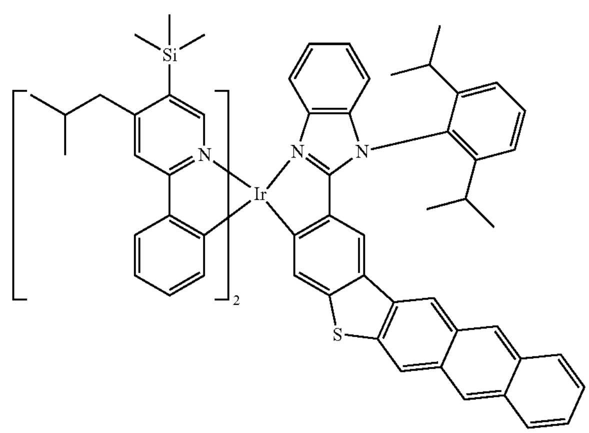
3230
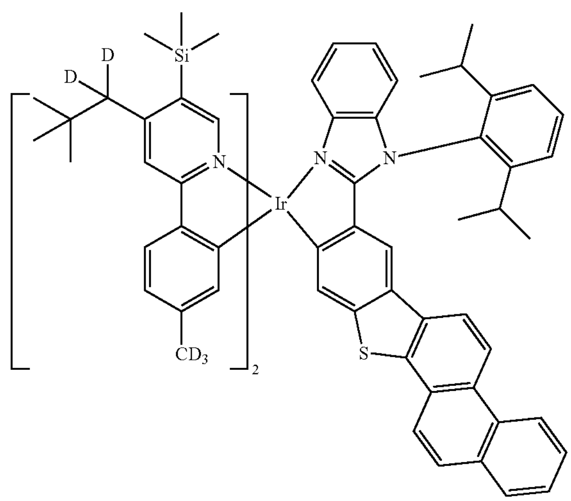

-continued
3231
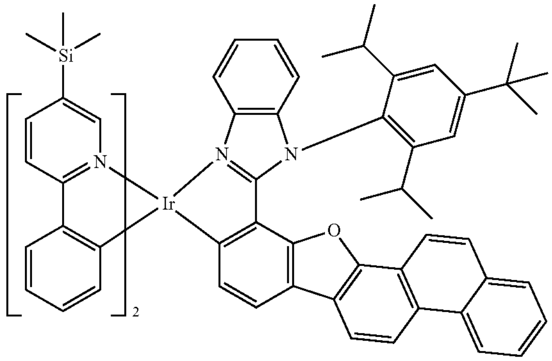
3232
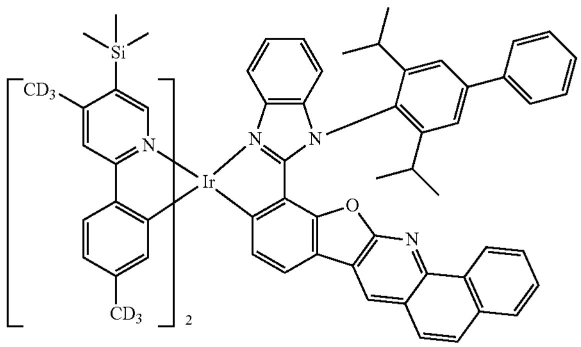
3233
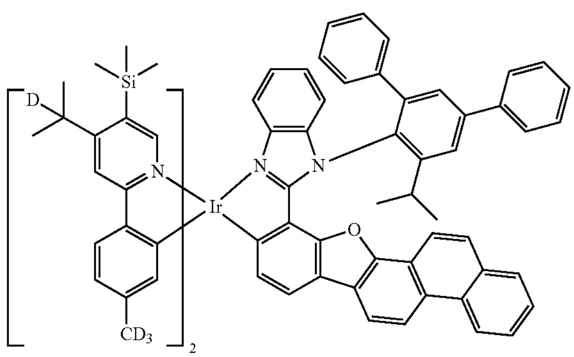
3234
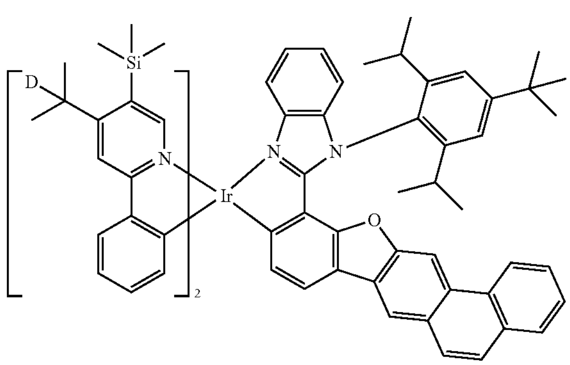
3235
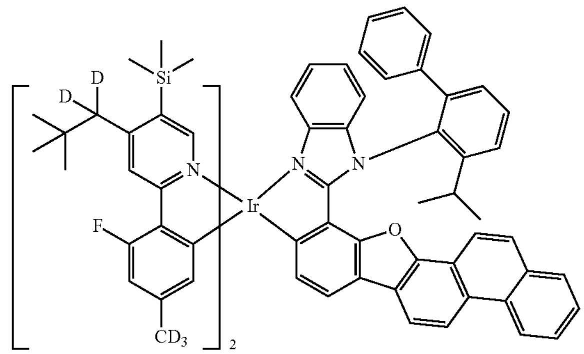
3236
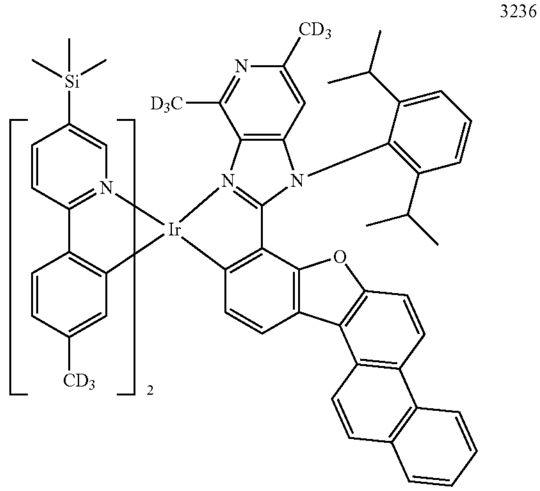
3237
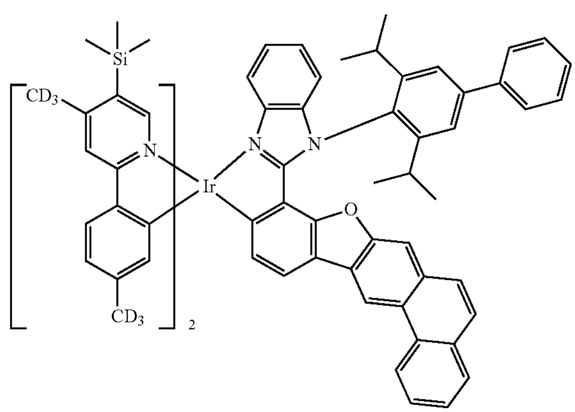

-continued
3238
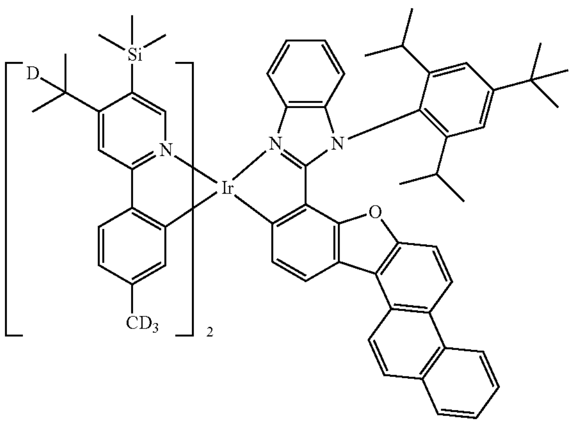
3239
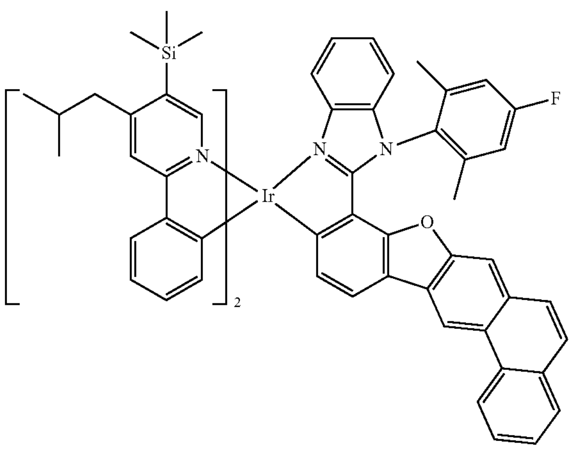
3240
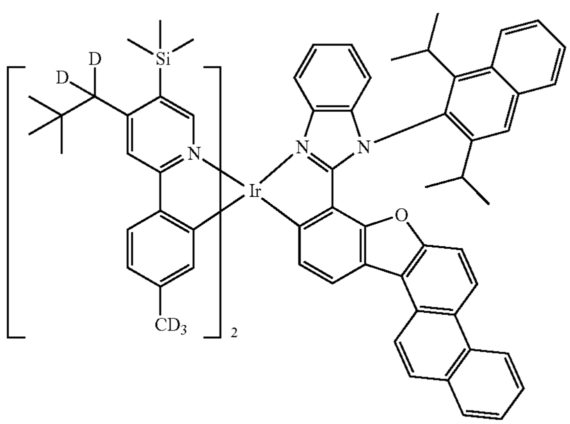
-continued
3241
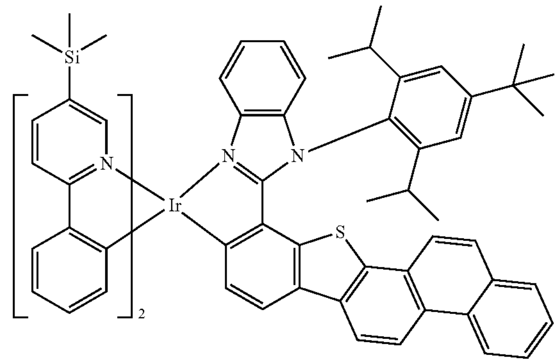
3242
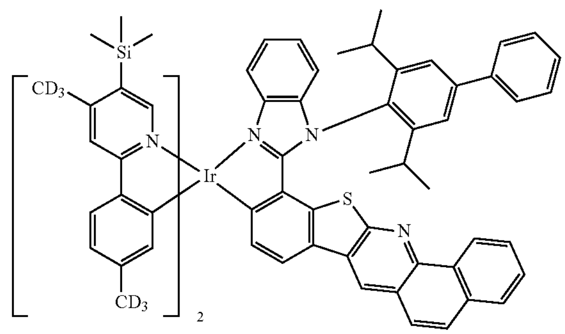
3243
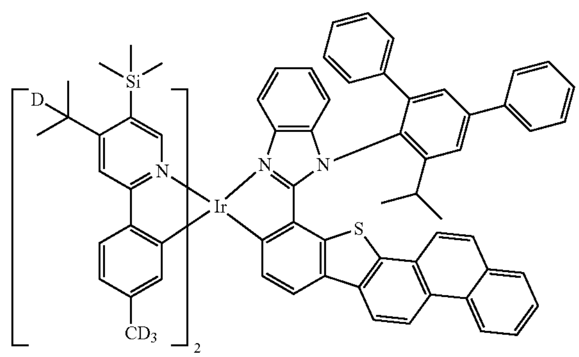
3244
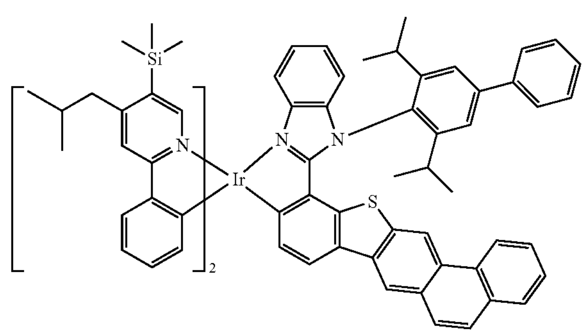

3245
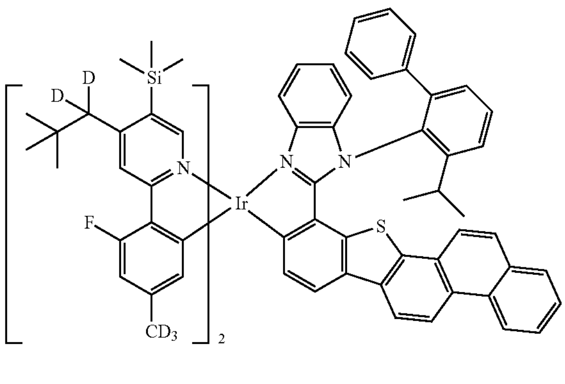
3246
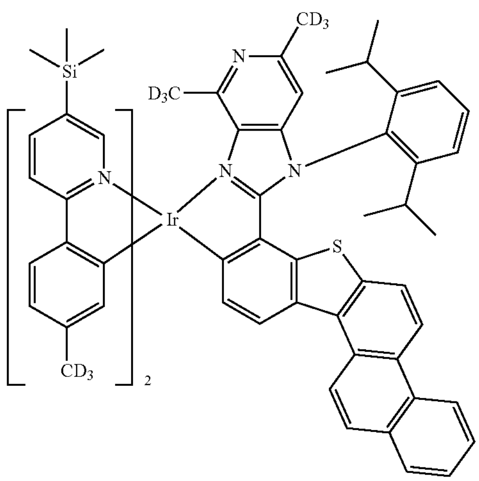
3247
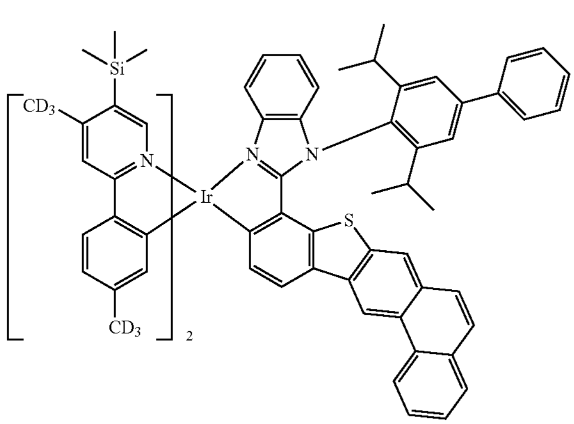
3248
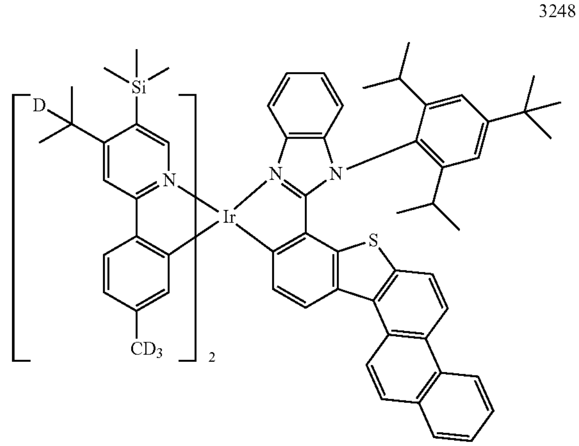
3249
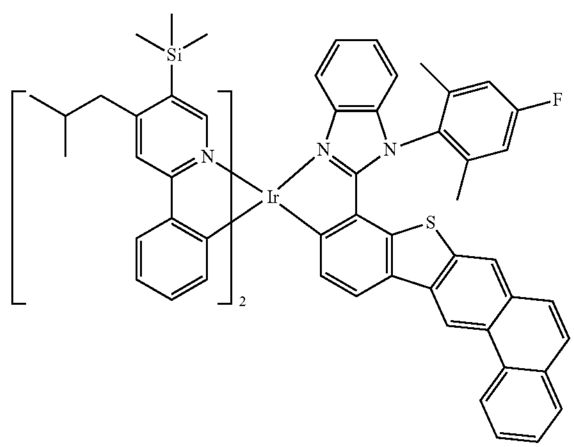
3250
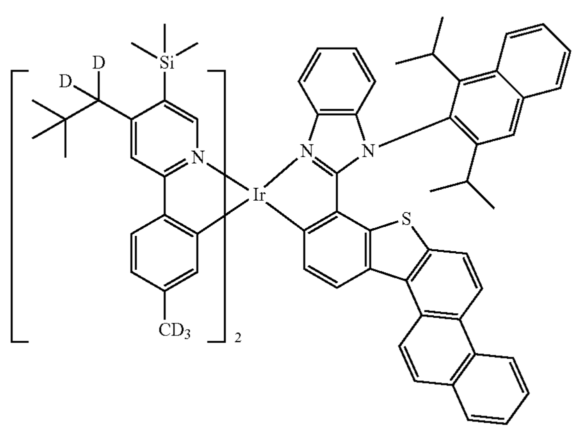

-continued
3251
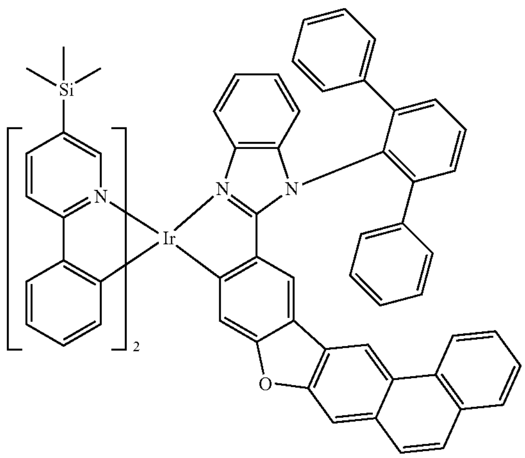
3252
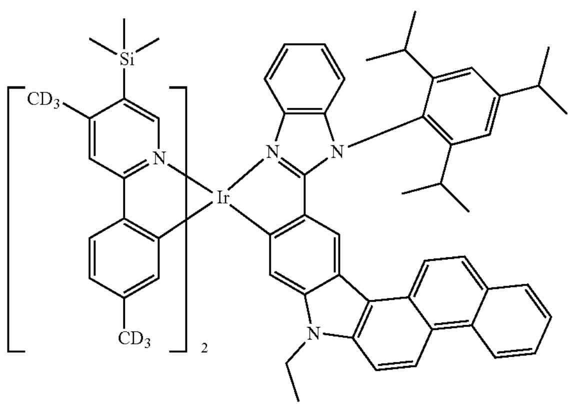
3253
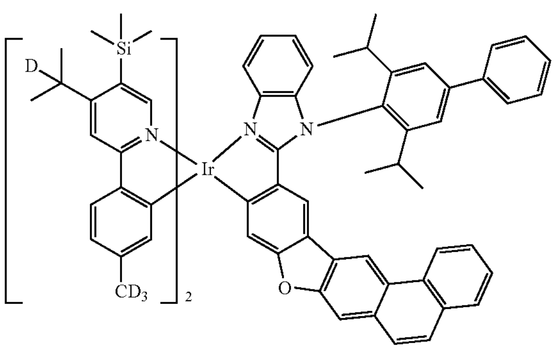
3254
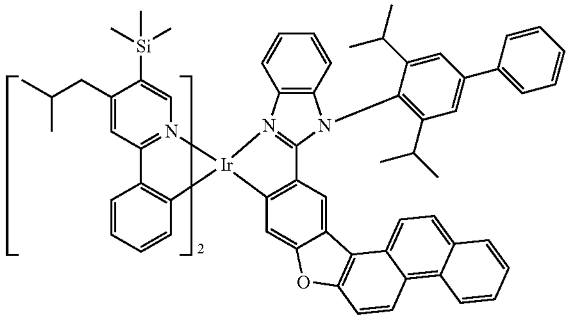
-continued
3255
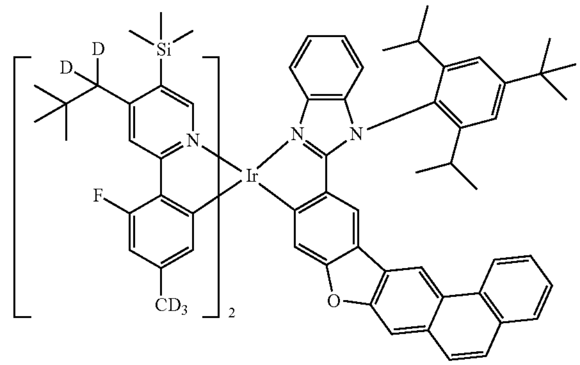
3256
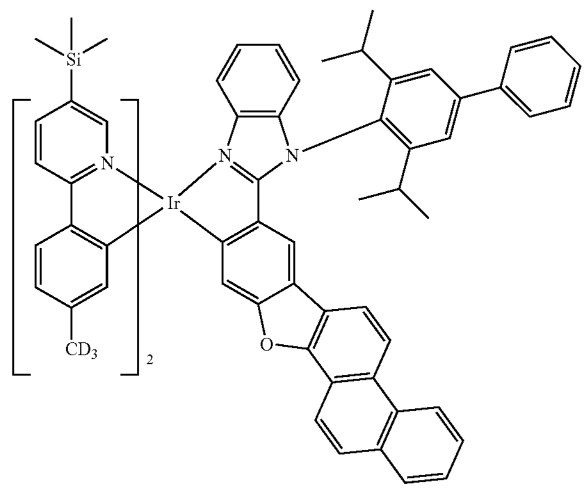
3257
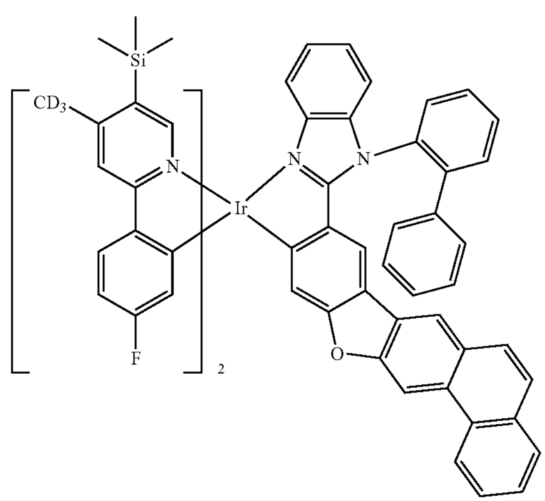

3258
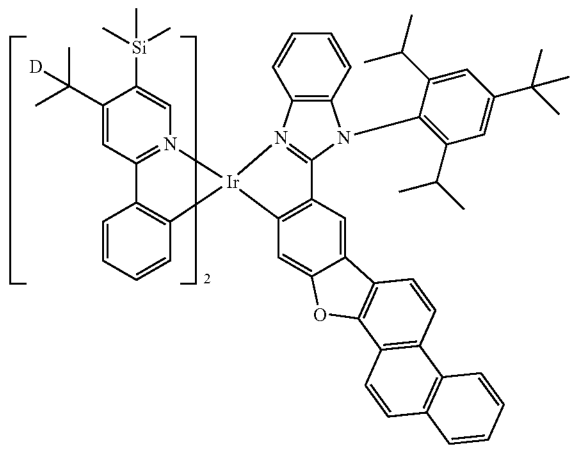
3259
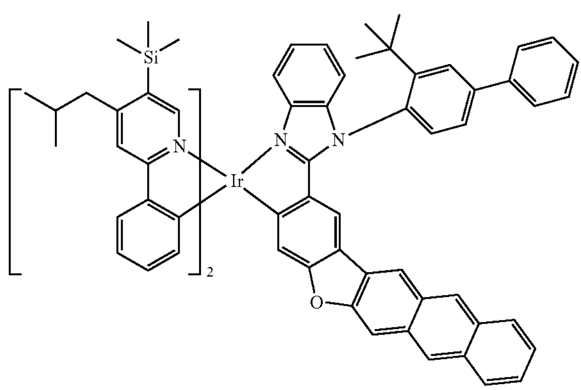
3260
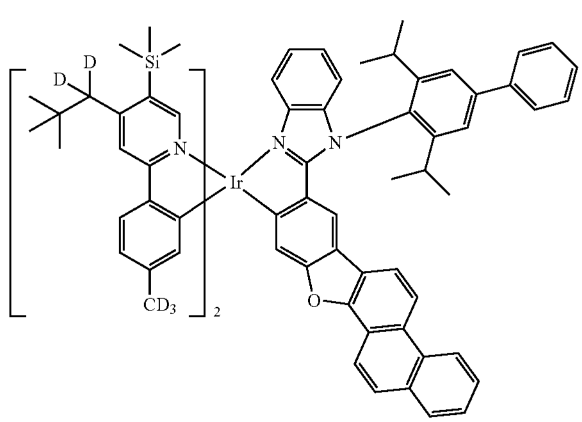
3261
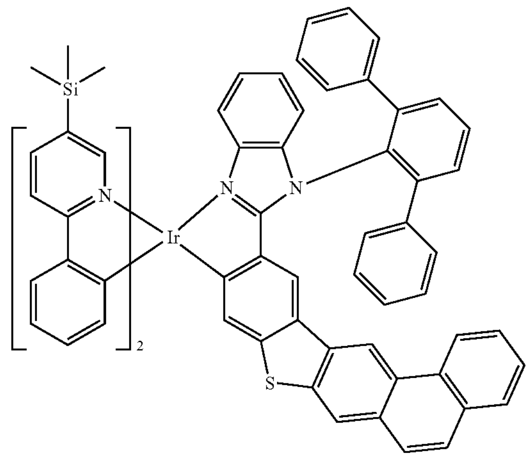
3262
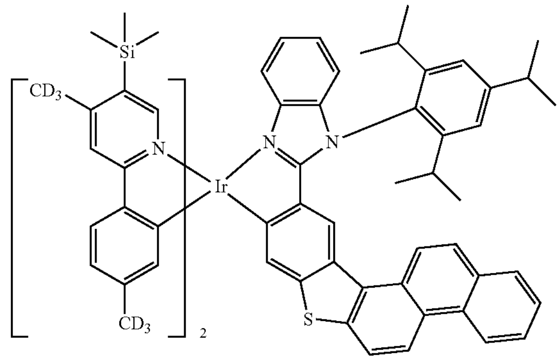
3263
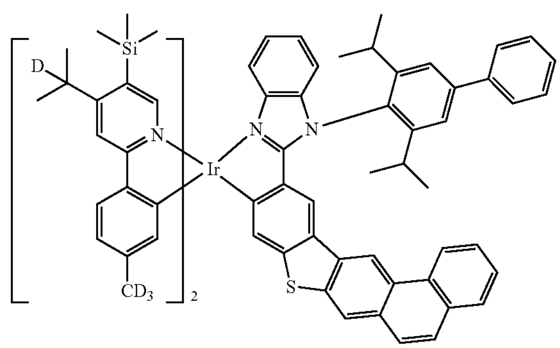
3264
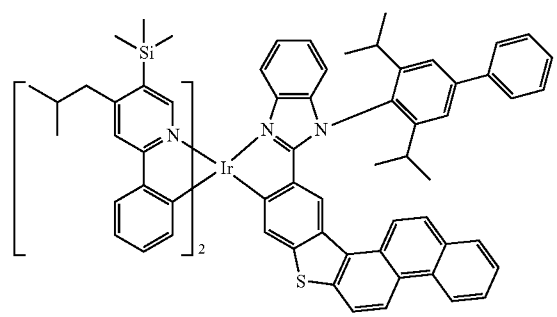

3265
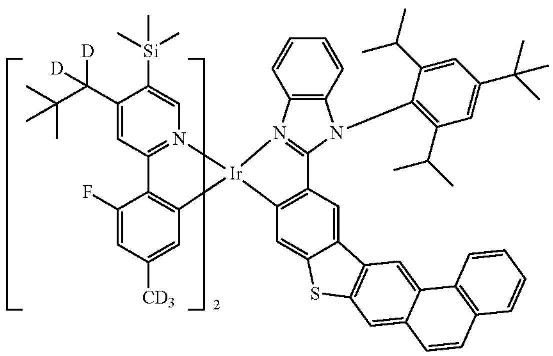
3266
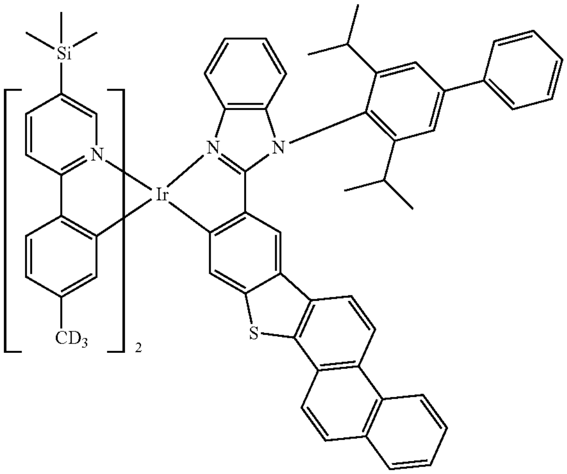
3267
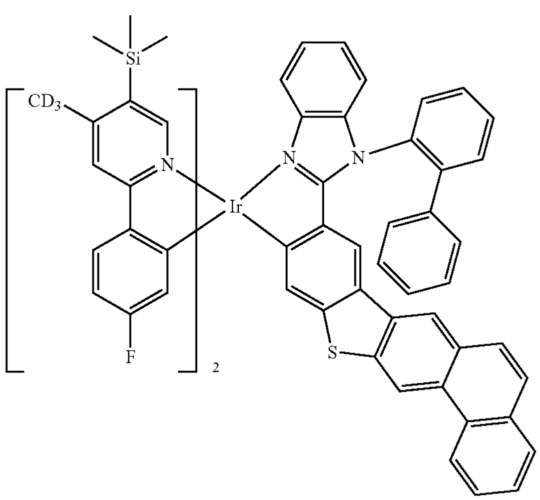
3268
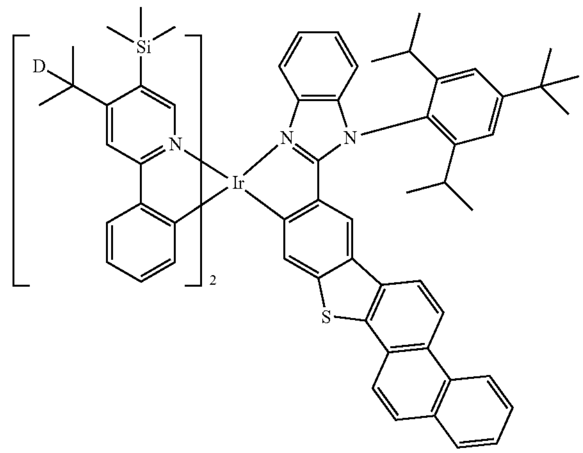
3269
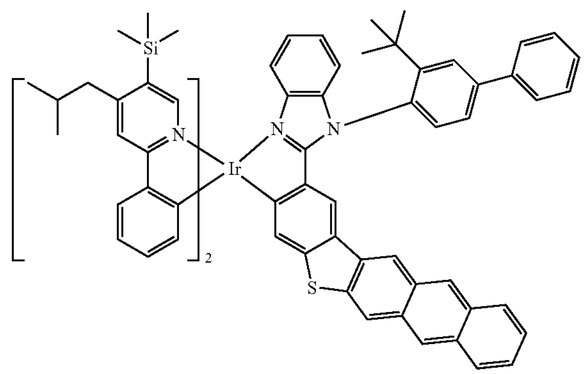
3270
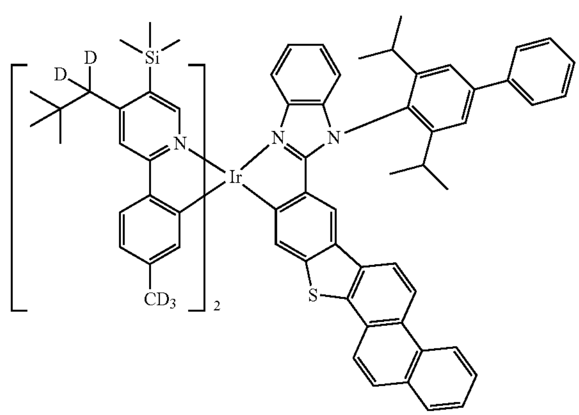

-continued
3271
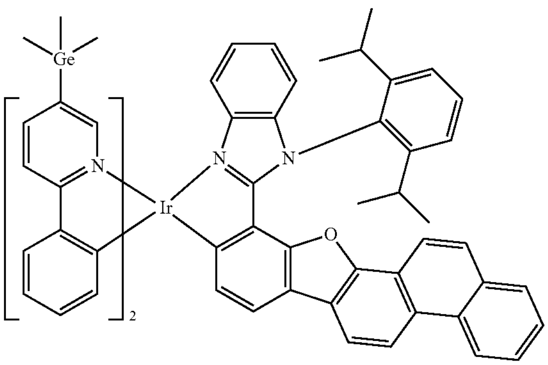
3272
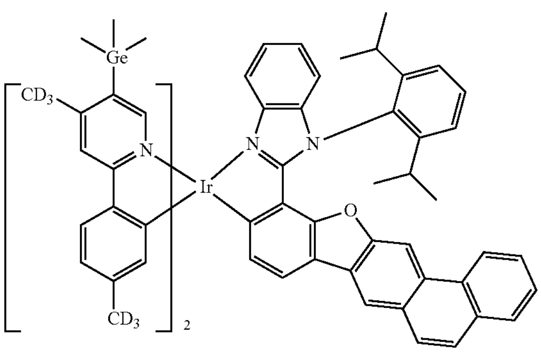
3273
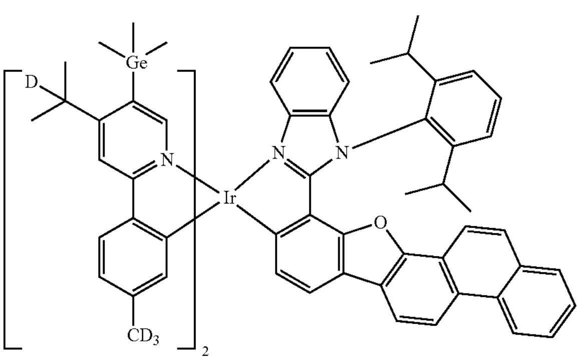
3274
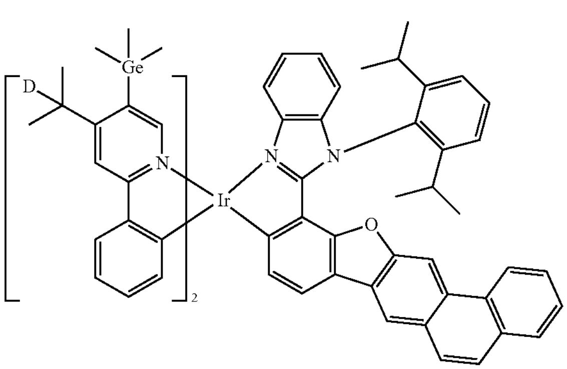
-continued
3275
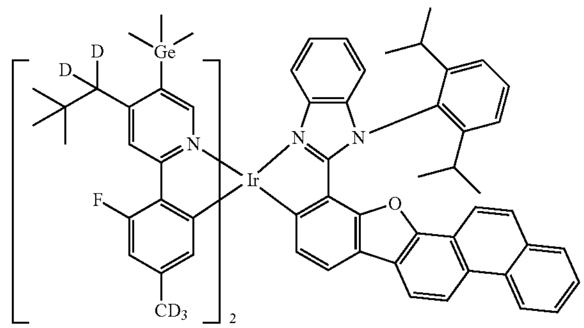
3276
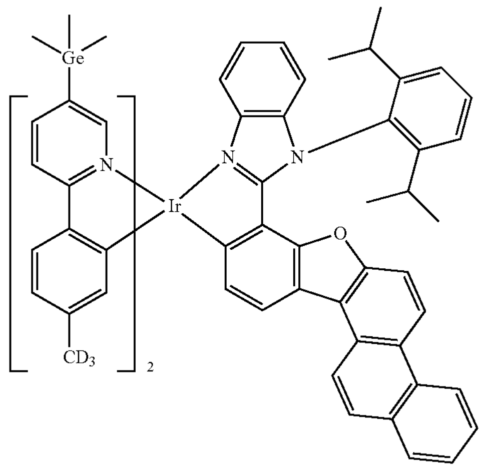
3277
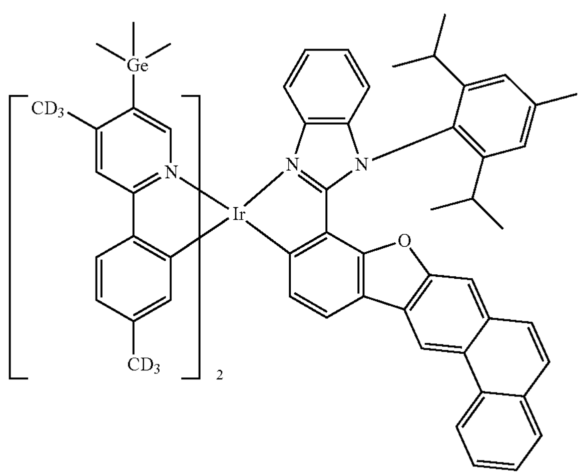

3278
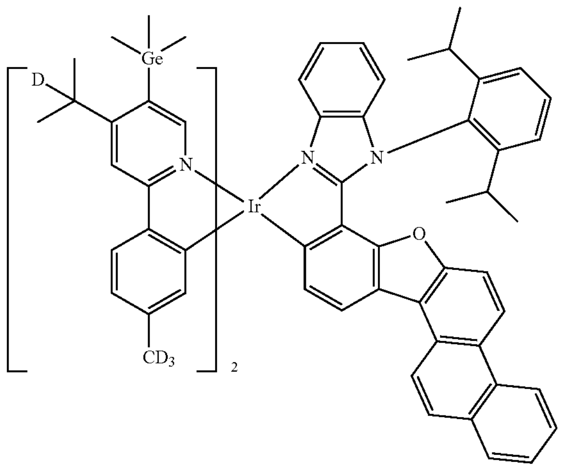
3279
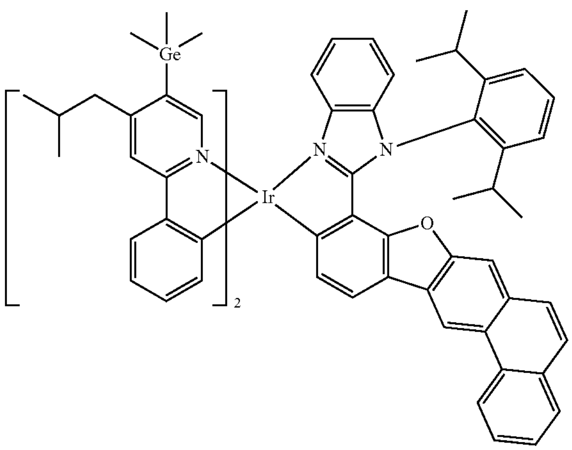
3280
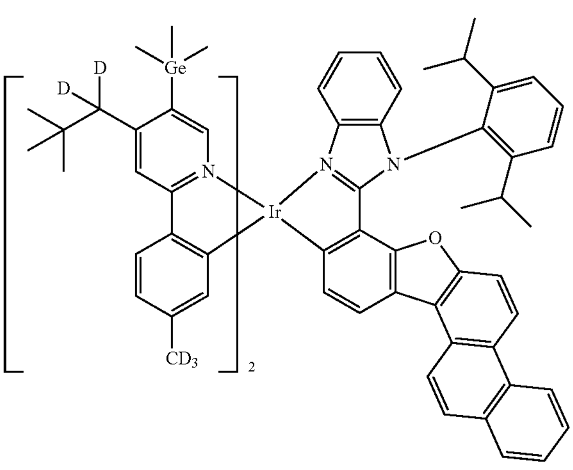
3281
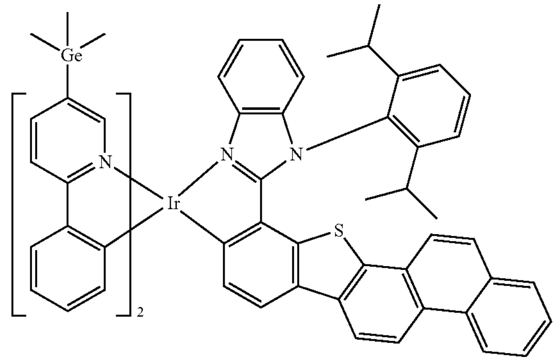
3282
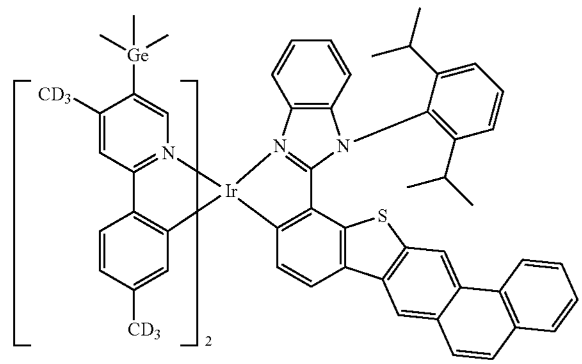
3283
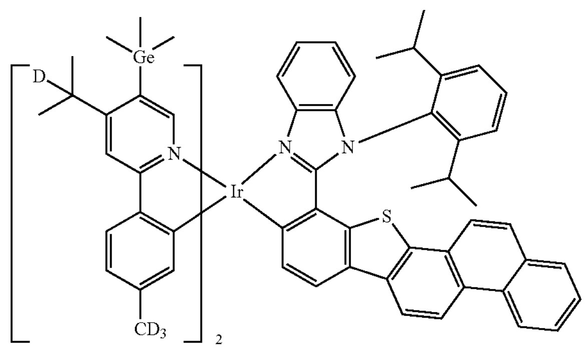
3284
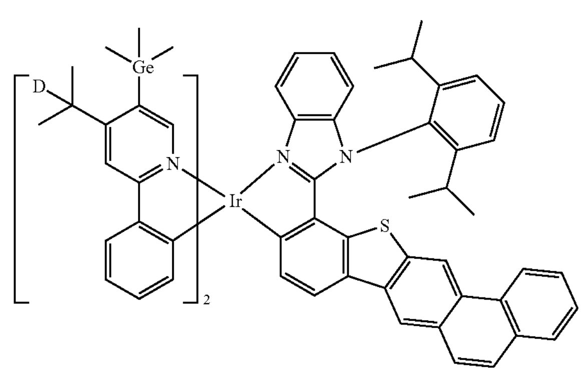

-continued
3285
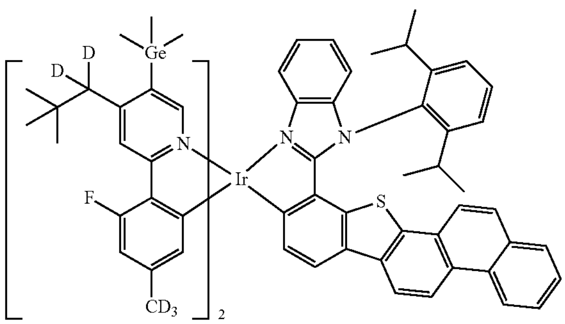
3286
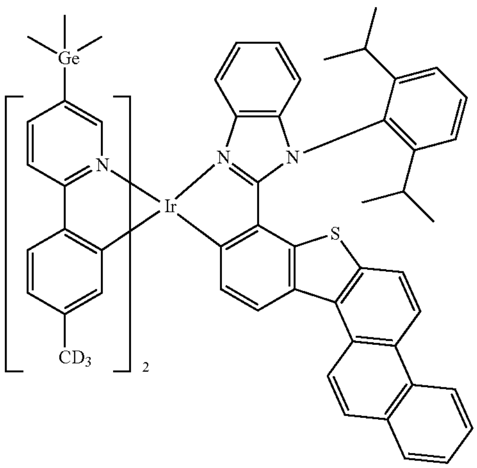
3287
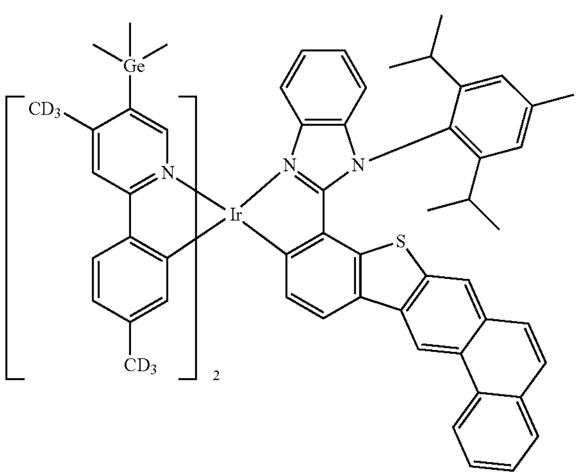
-continued
3288
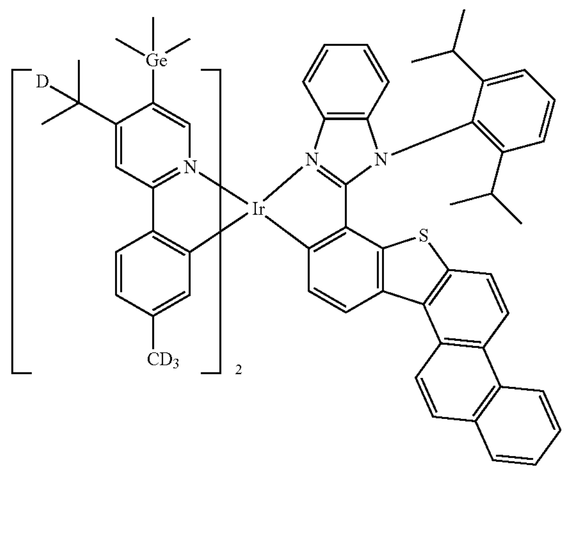
3289
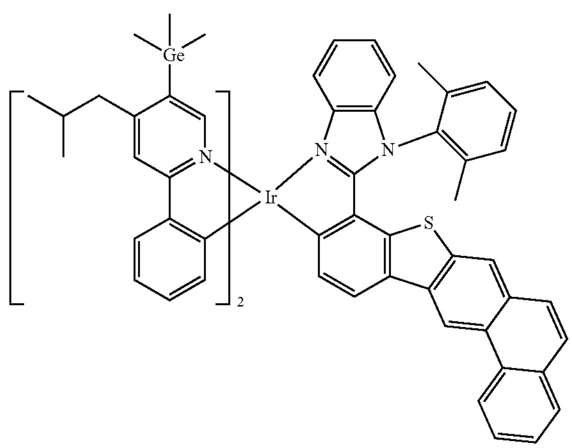
3290
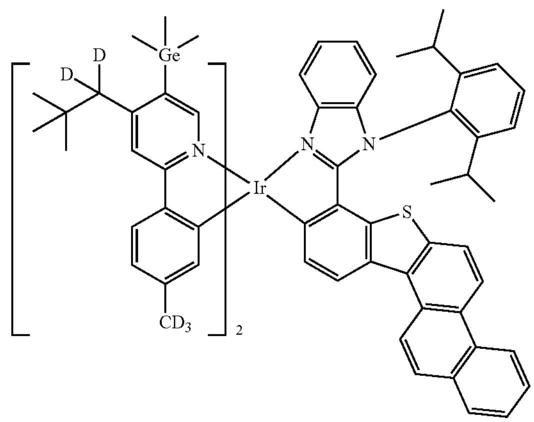

-continued
3291
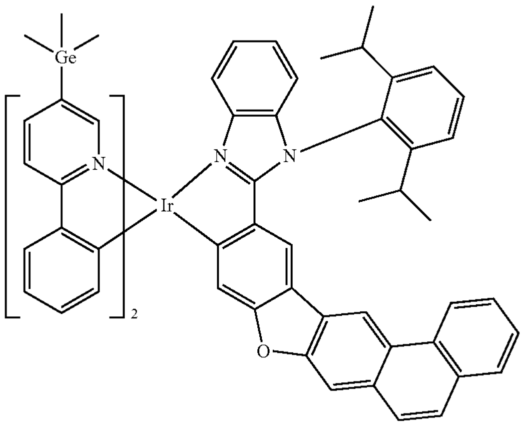
3292
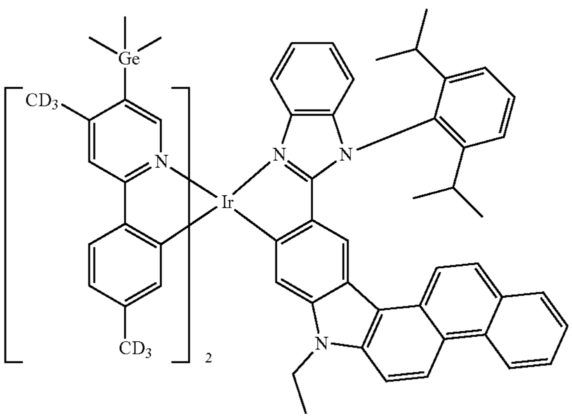
3293
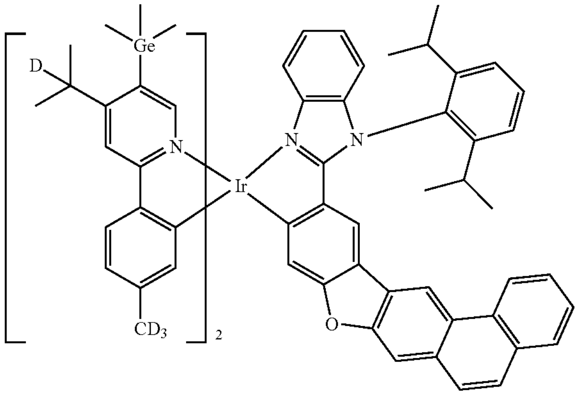
-continued
3294
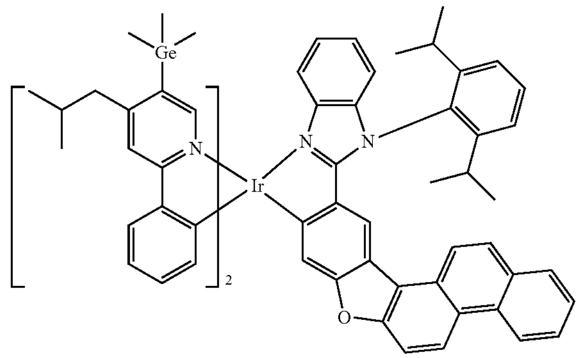
3295
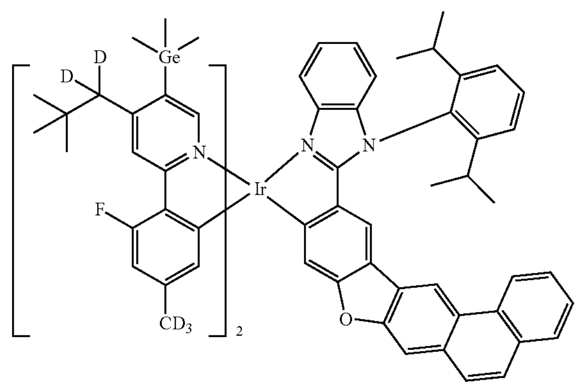
3296
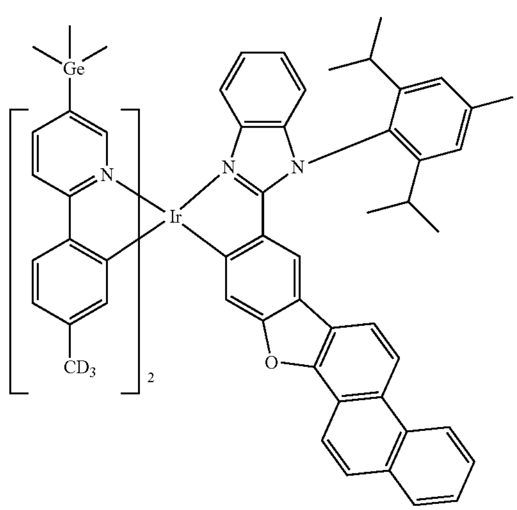

-continued
3297
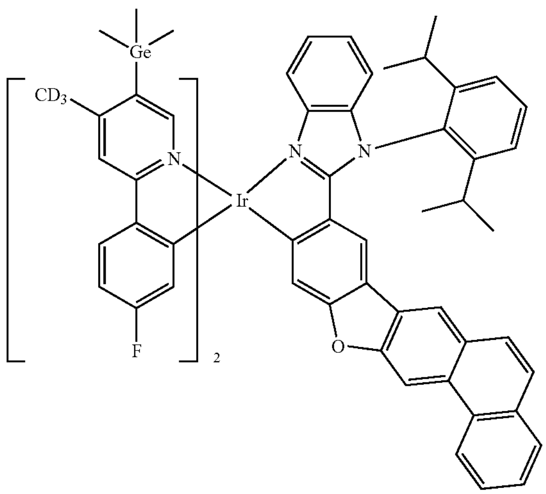
3298
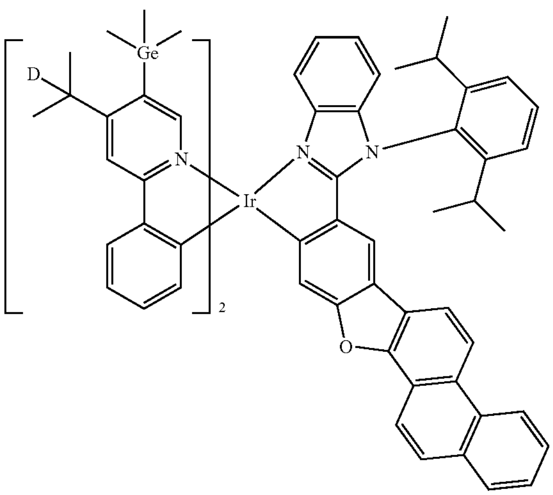
3299
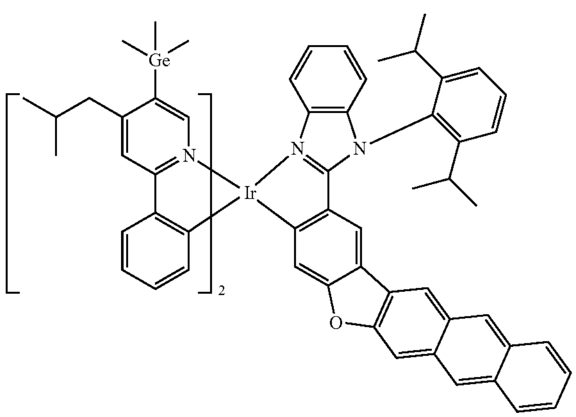
-continued
3300
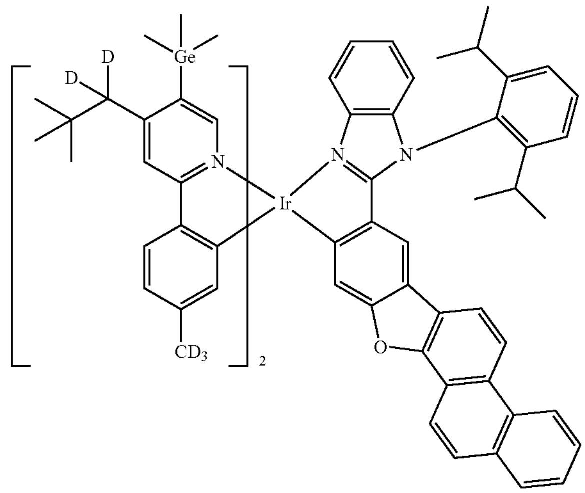
3301
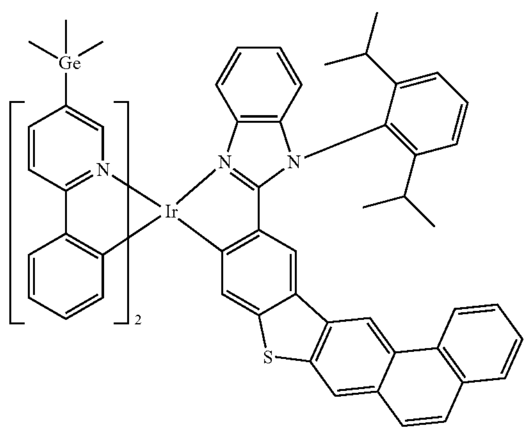
3302
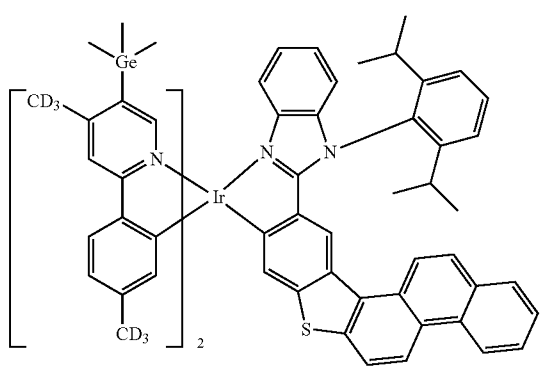

3303
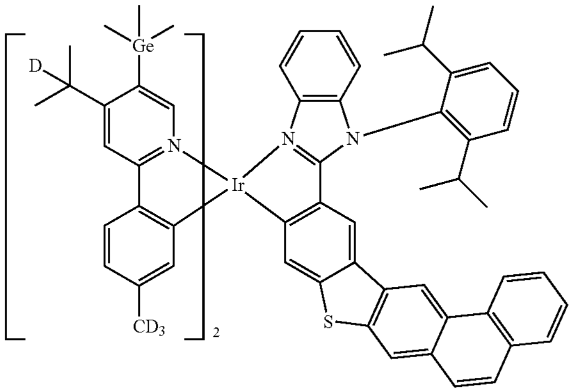
3304
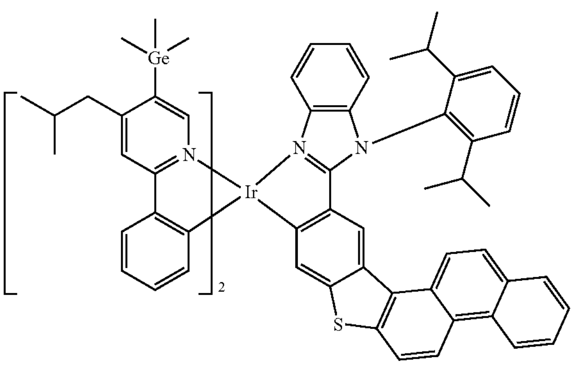
3305
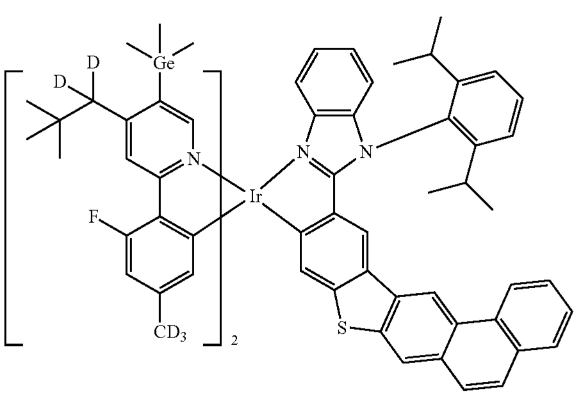
3306
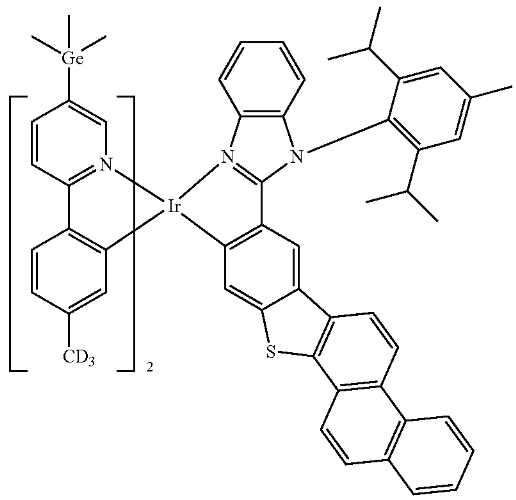
3307
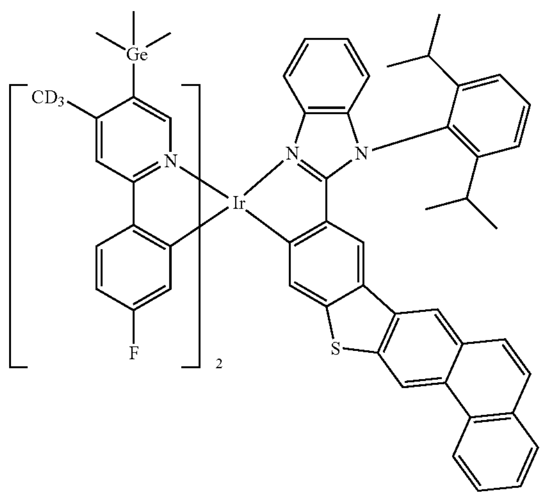
3308
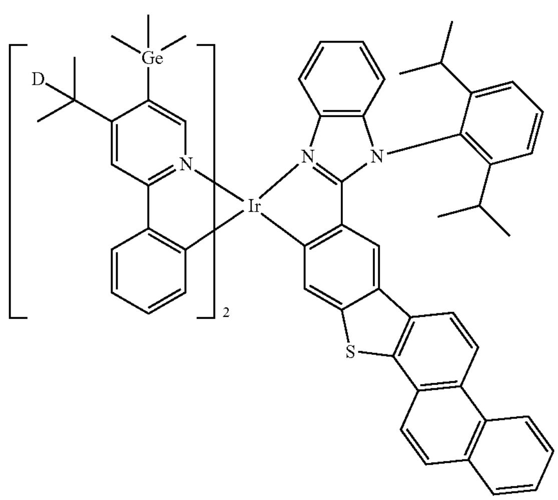

3309
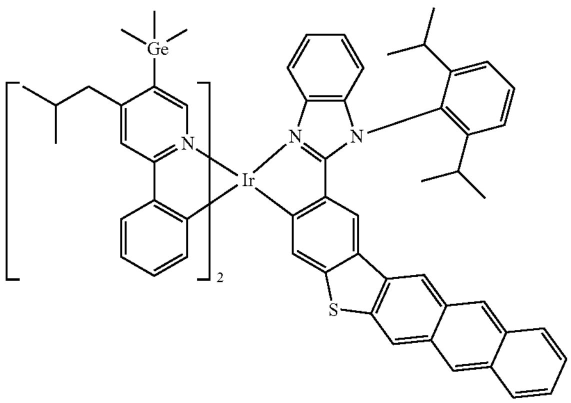
3310
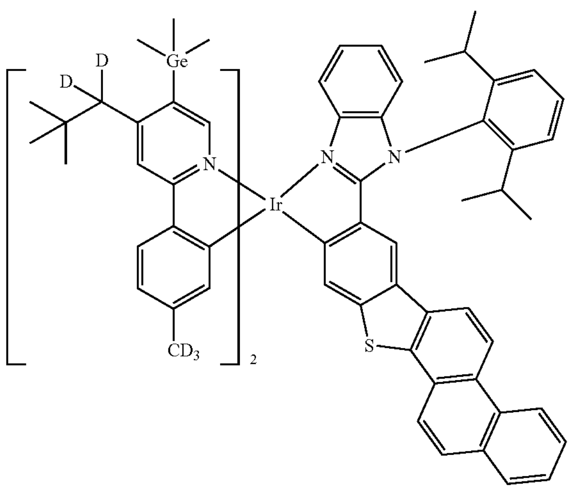
3311
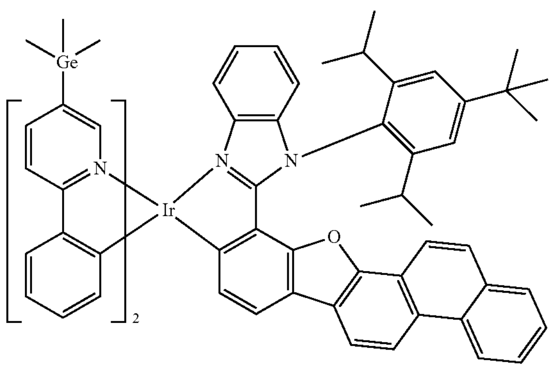
3312
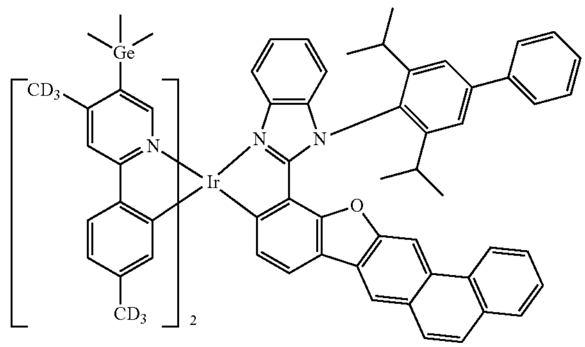
3313
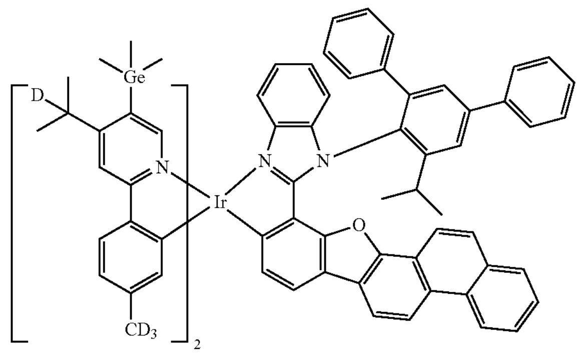
3314
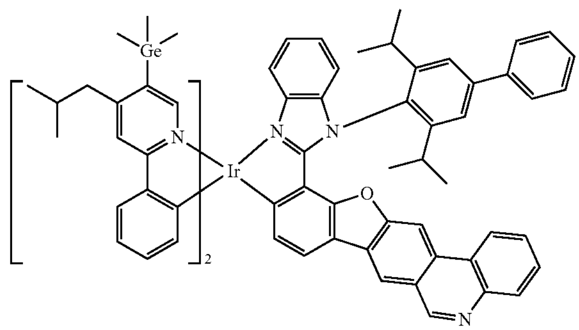
3315
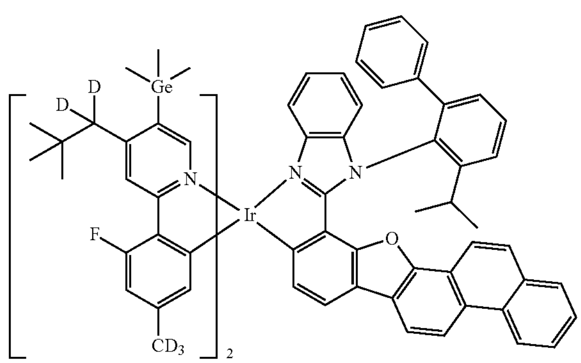

3316
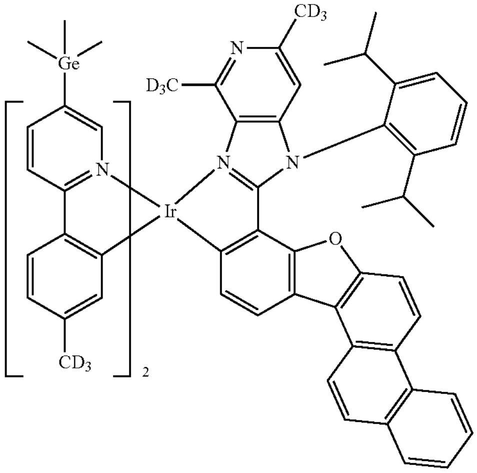
3317
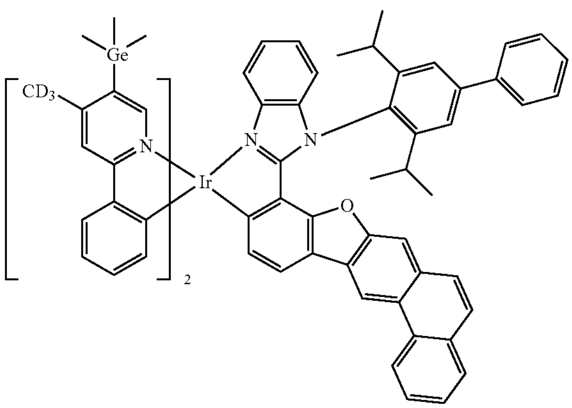
3318
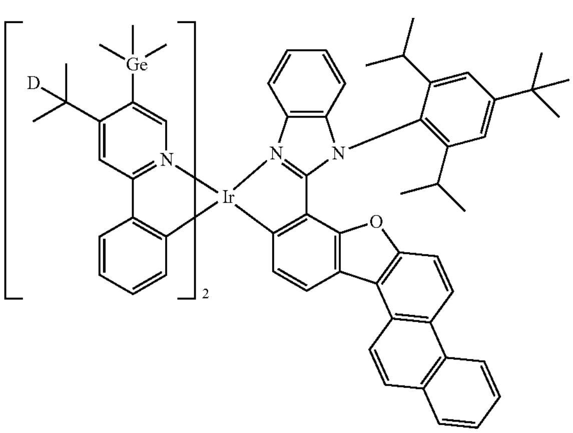
3319
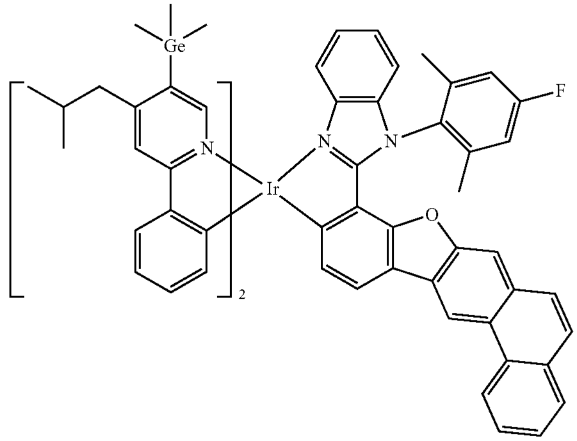
3320
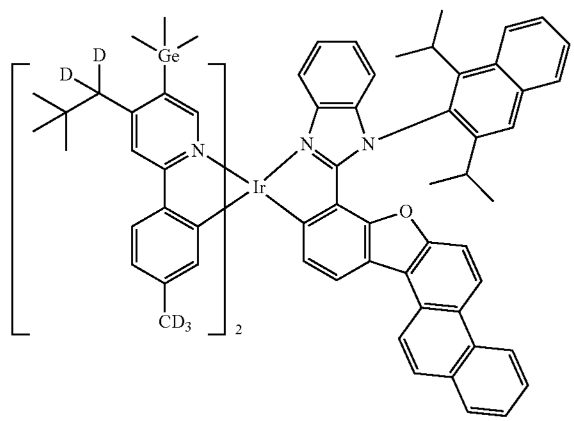
3321
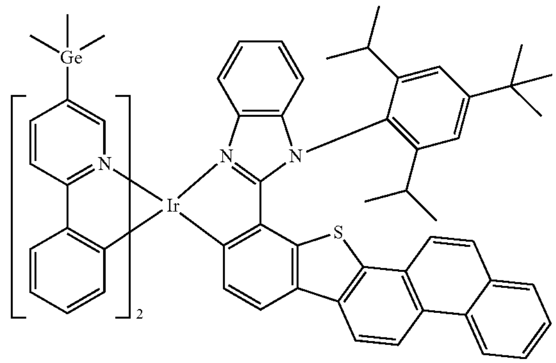
3322
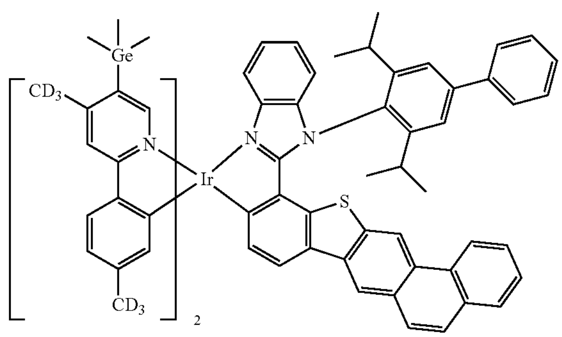

-continued
3323
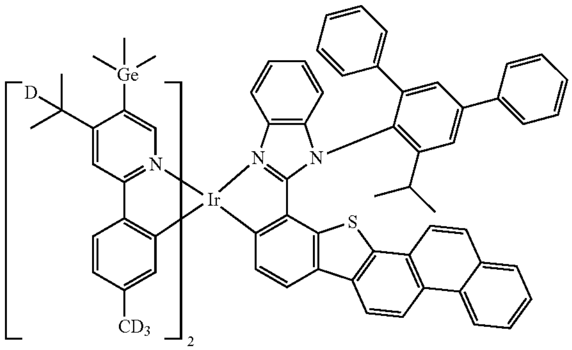
3324
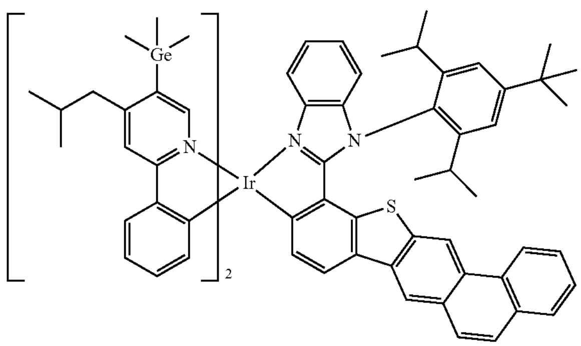
3325
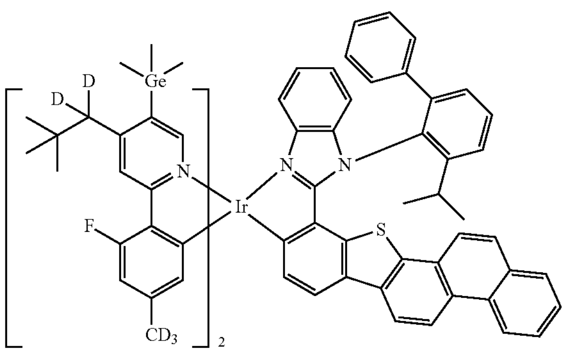
3326
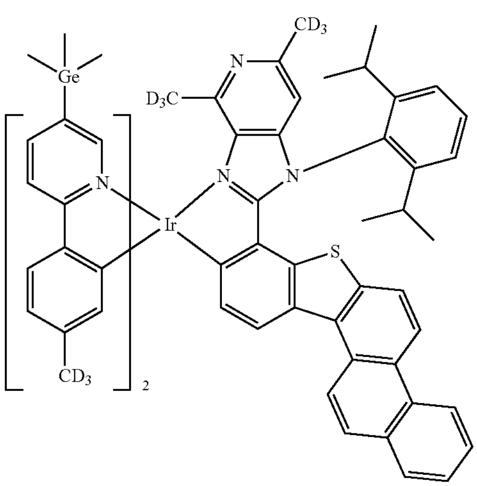
-continued
3327
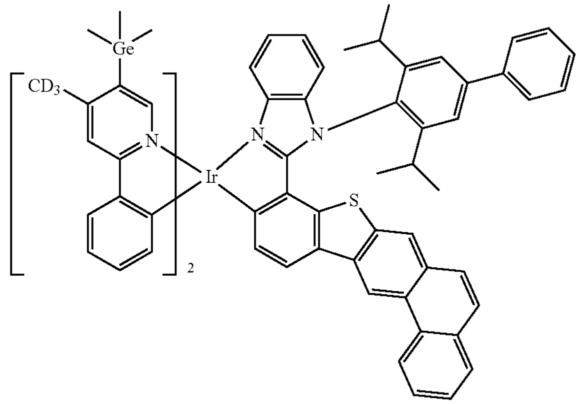
3328
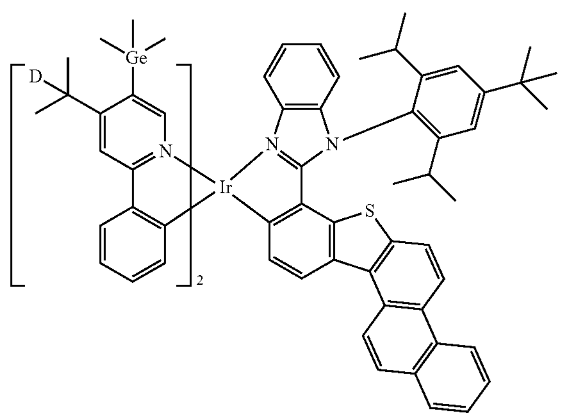
3329
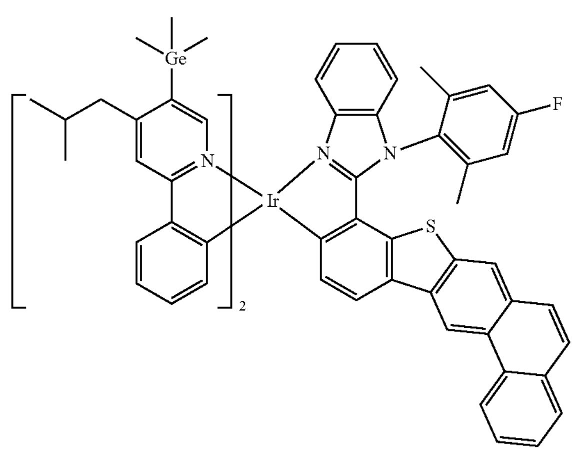

-continued
3330
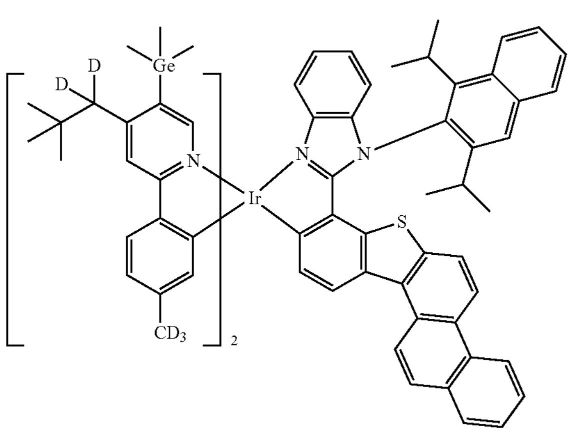
3331
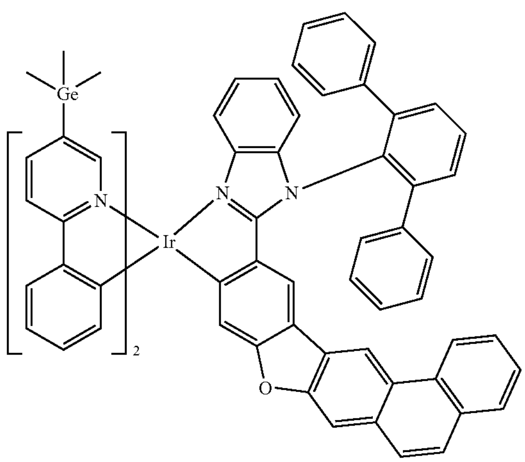
3332
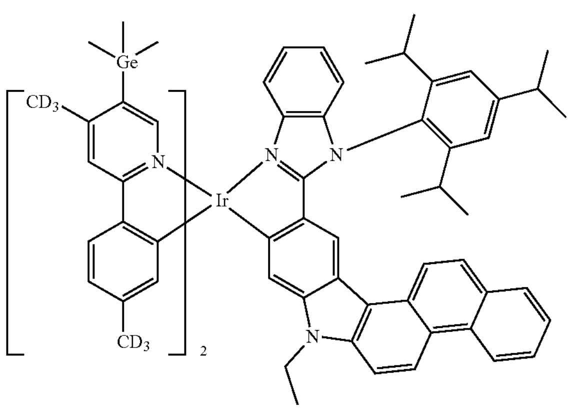
-continued
3333
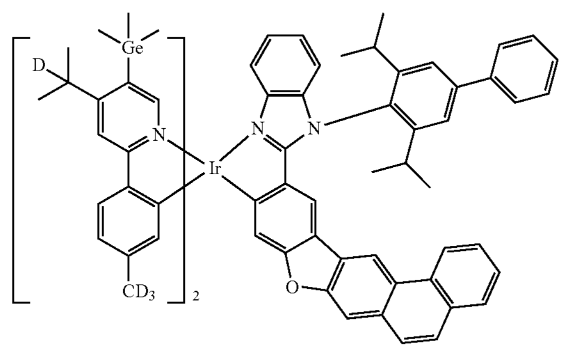
3334
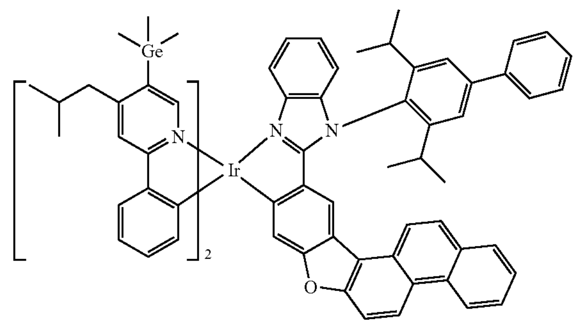
3335
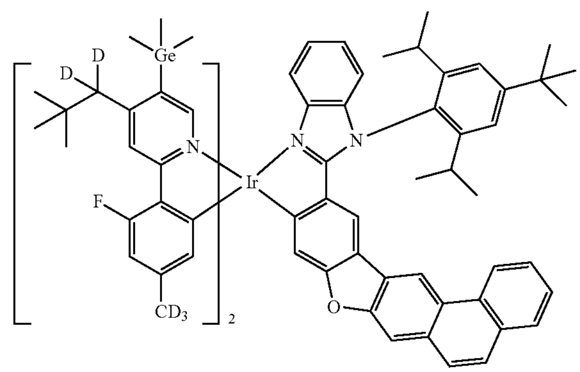
3336
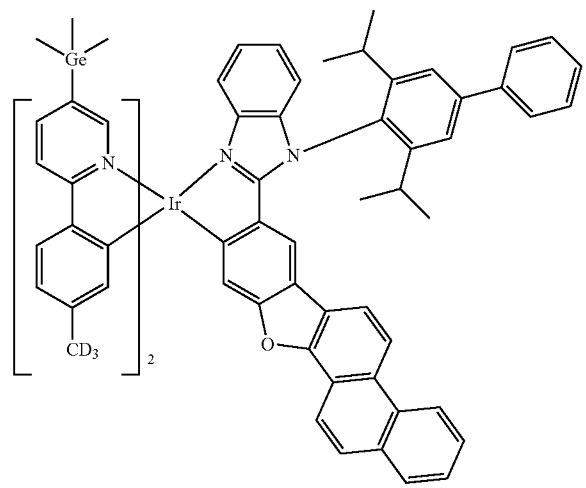

-continued
3337
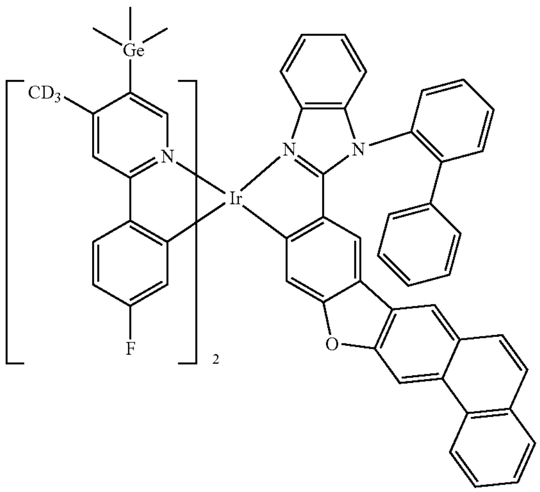
3338
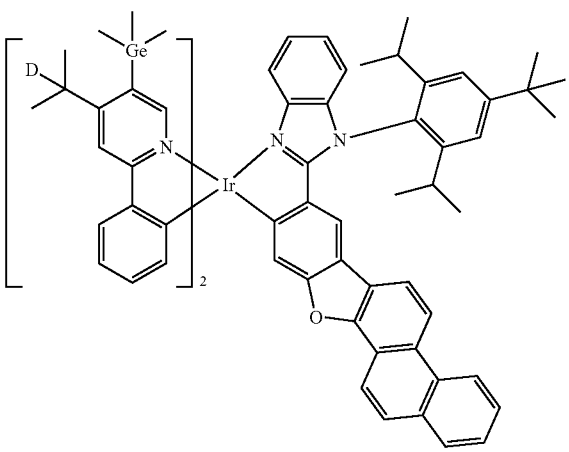
3339
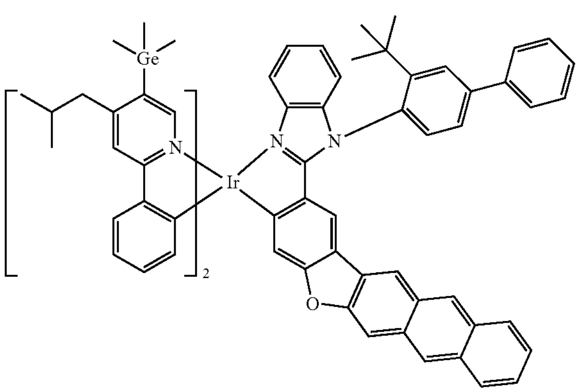
-continued
3340
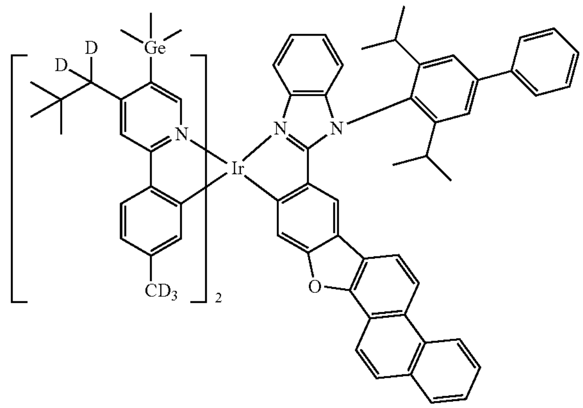
3341
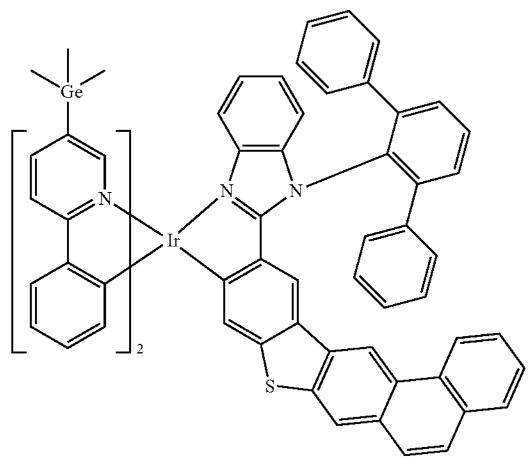
3342
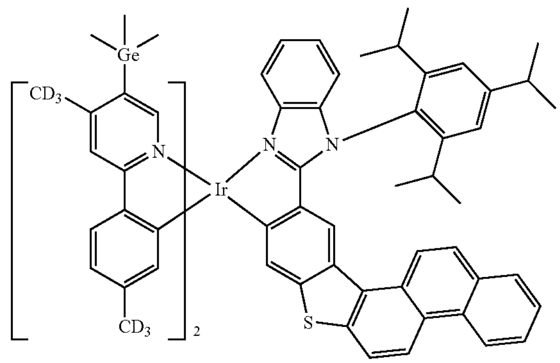
3343
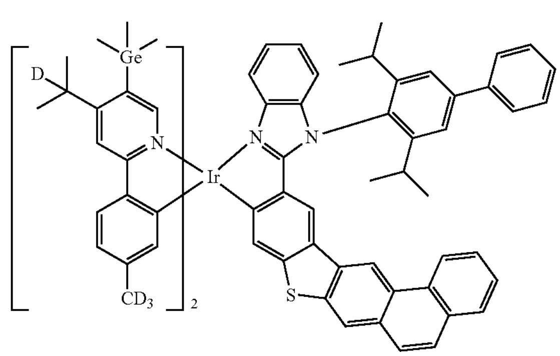

-continued
3344
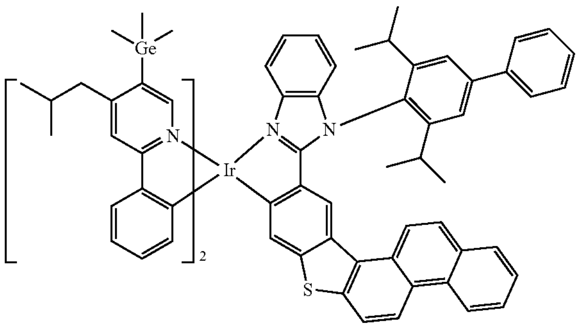
3345
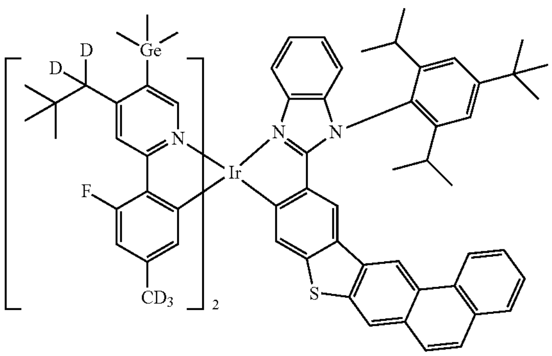
3346
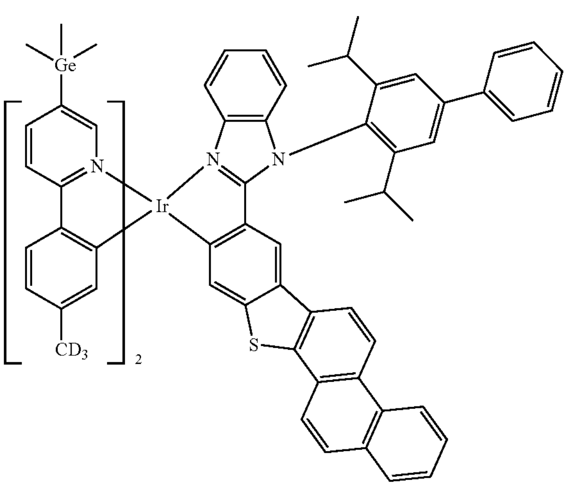
-continued
3347
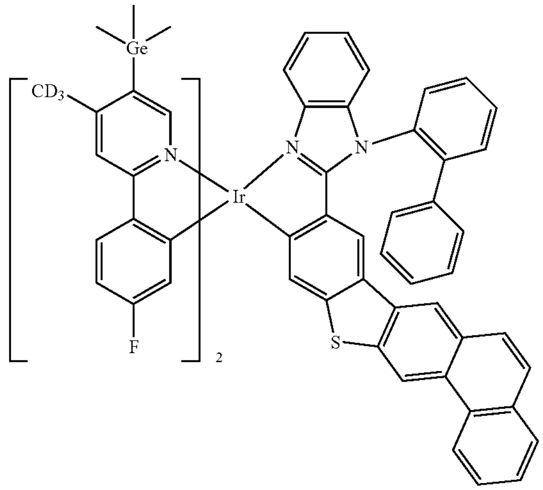
3348
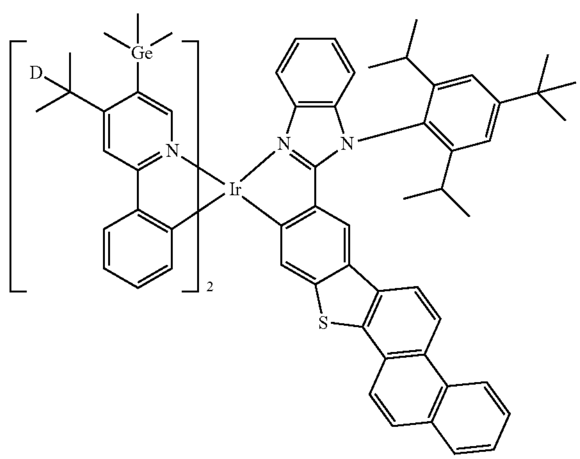
3349
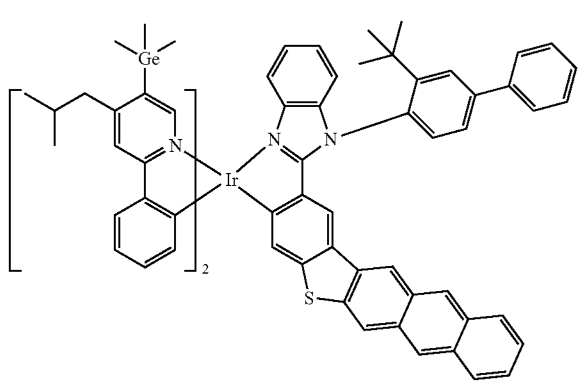

-continued
3350
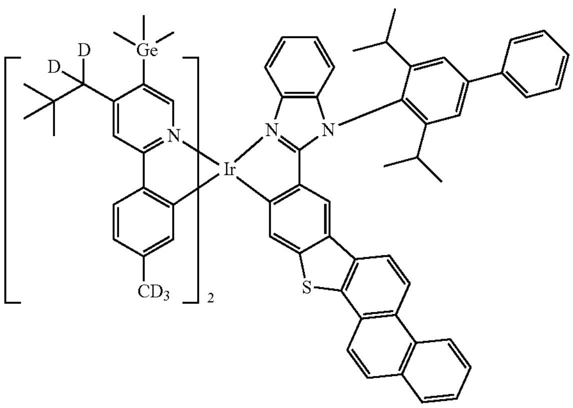
Group 1-2
1
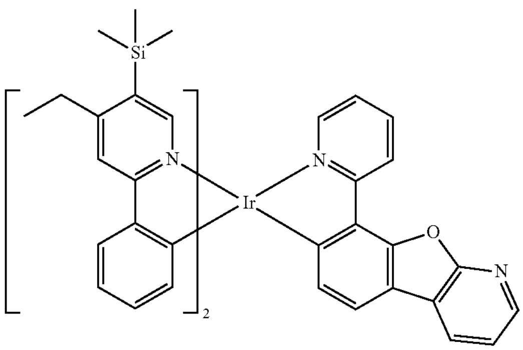
2
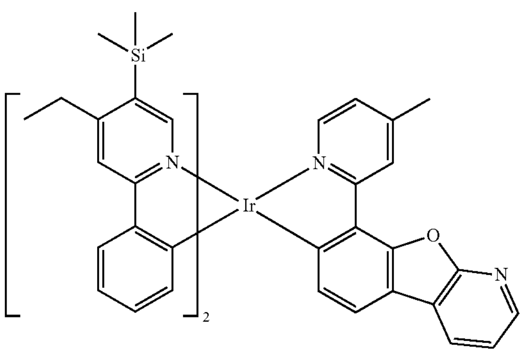
3
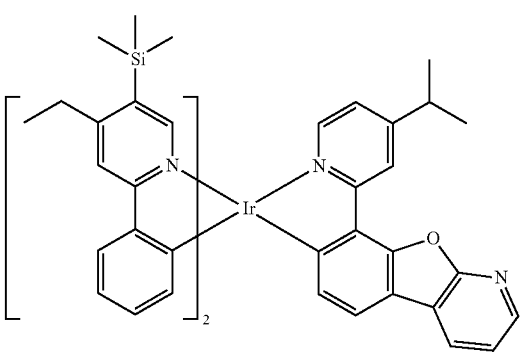
-continued
4
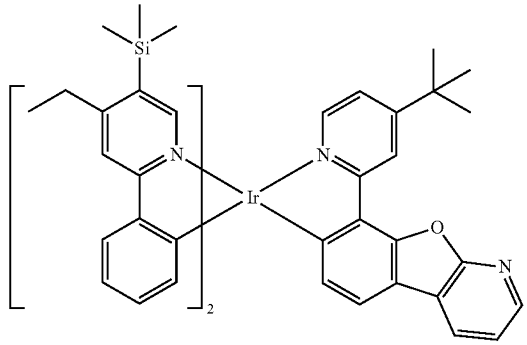
5
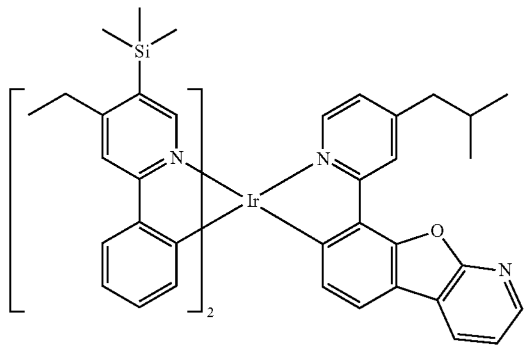
6
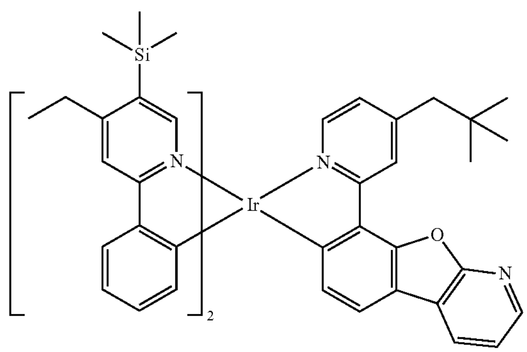
7
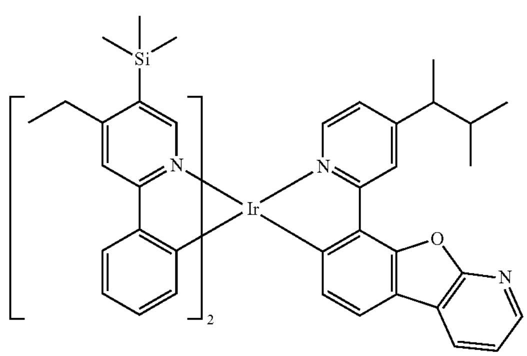

-continued
8
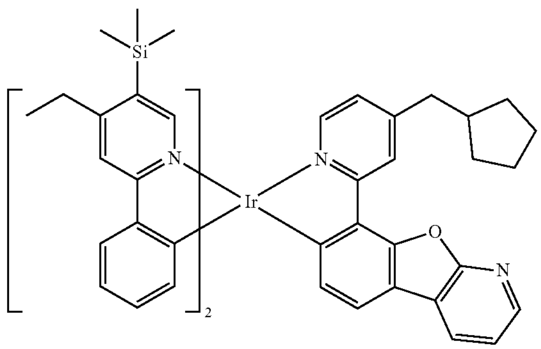
9
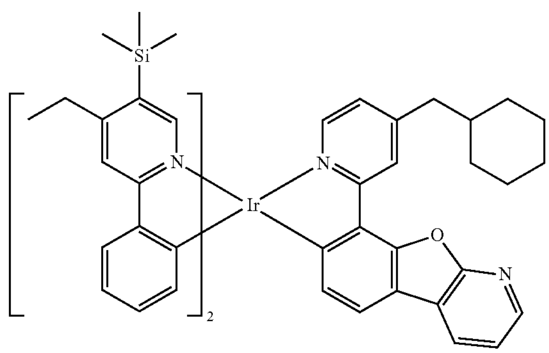
10
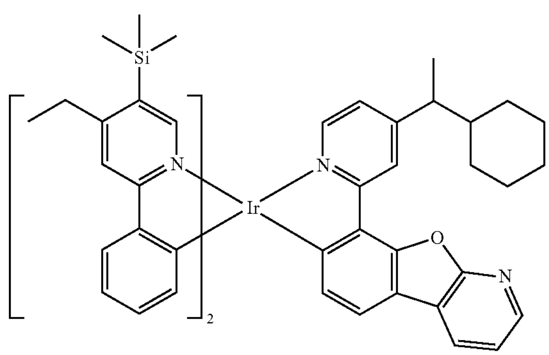
11
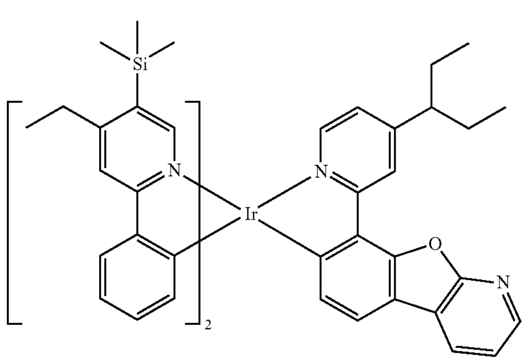
-continued
12
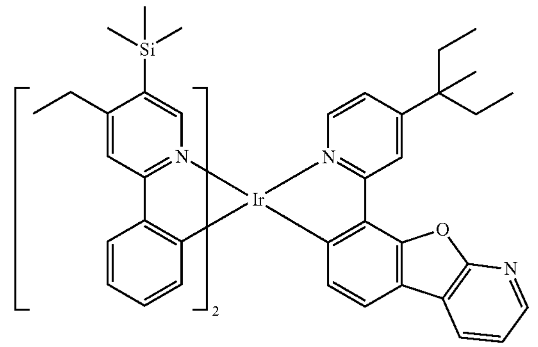
13
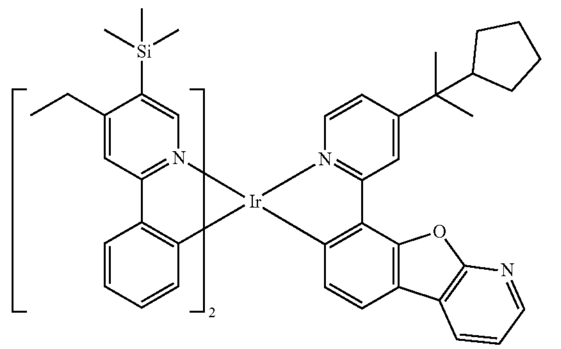
14
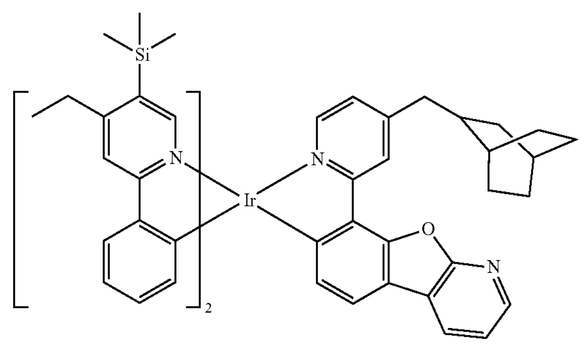
15
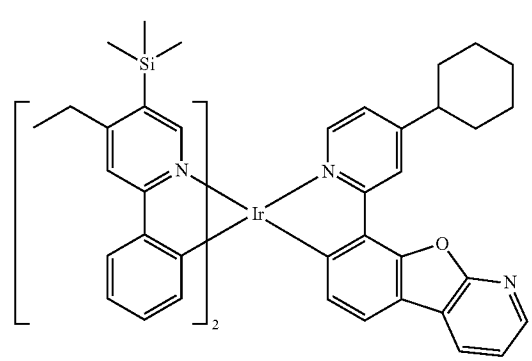

16
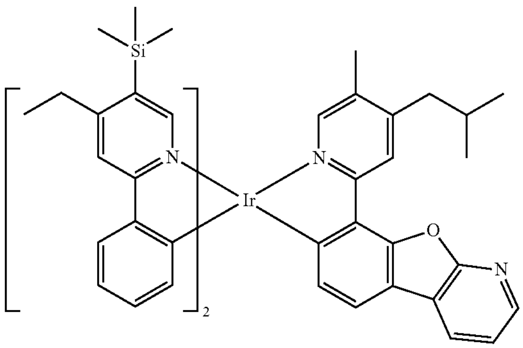
17
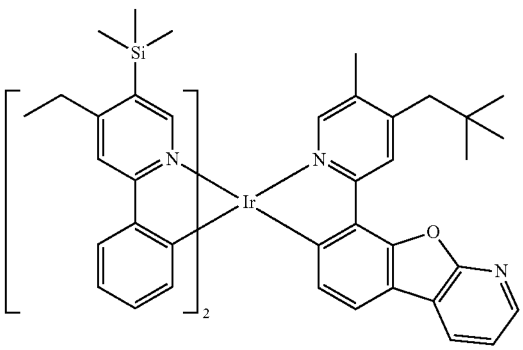
18
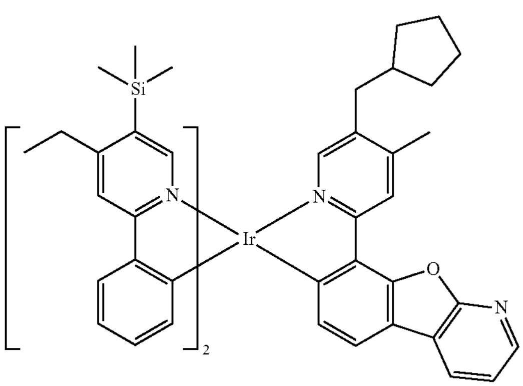
19
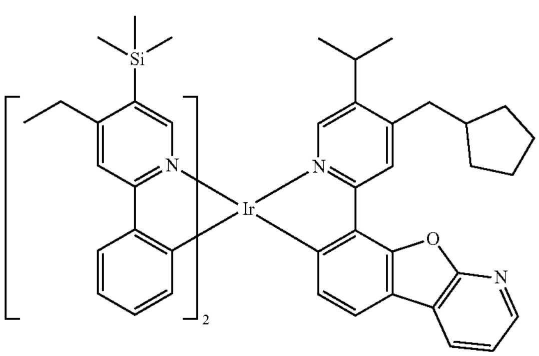
20
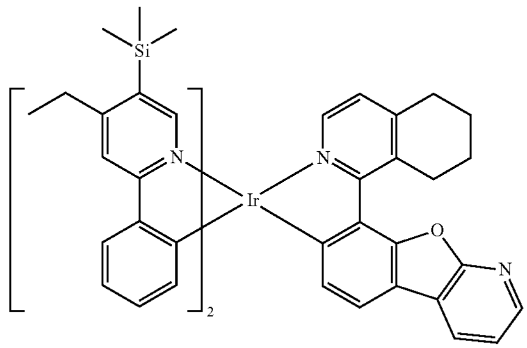
21
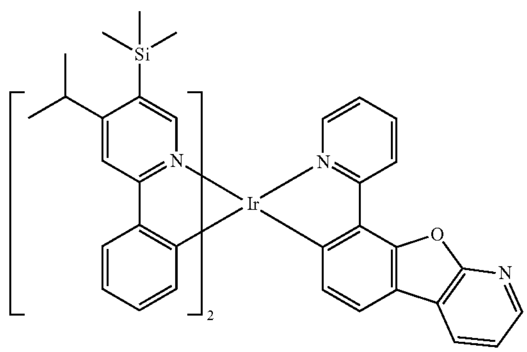
22
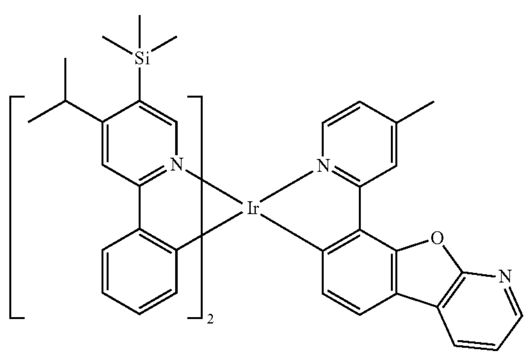
23
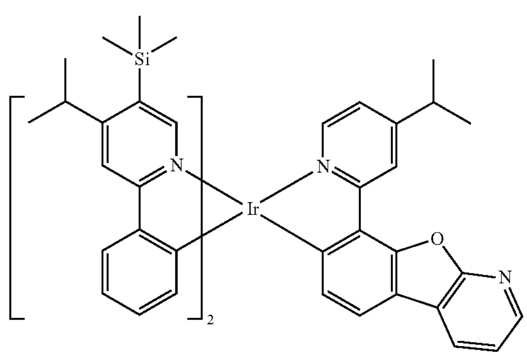

-continued
24
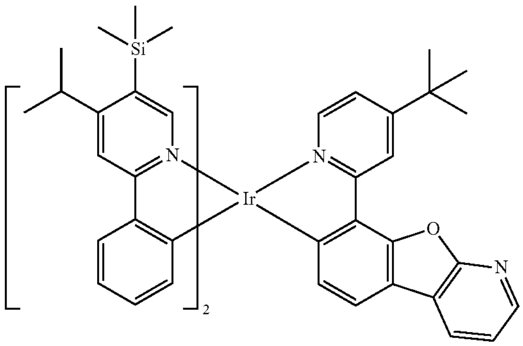
25
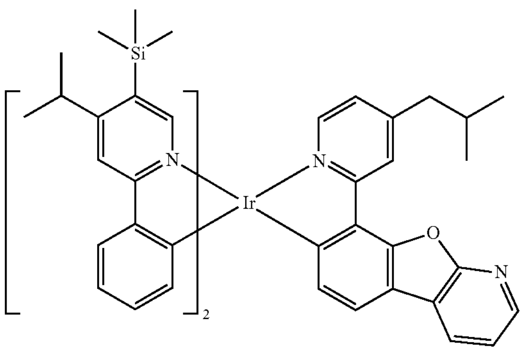
26
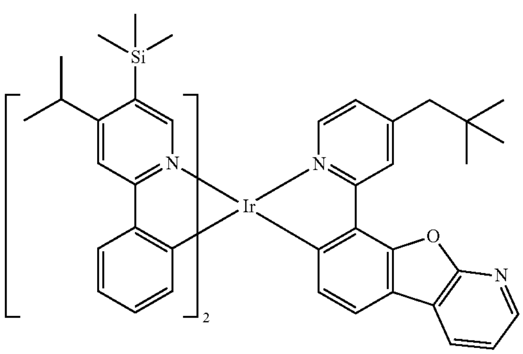
27
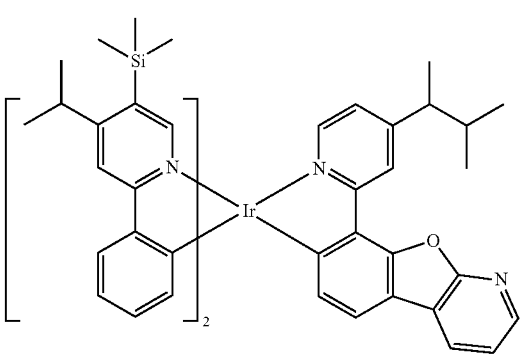
-continued
28
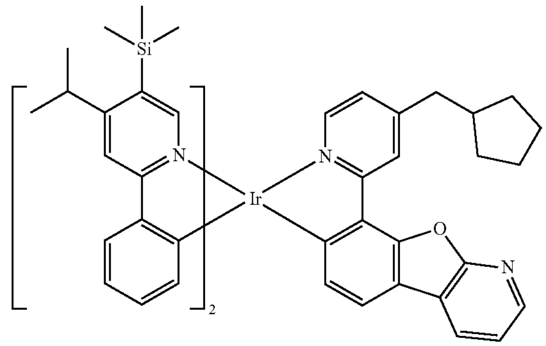
29
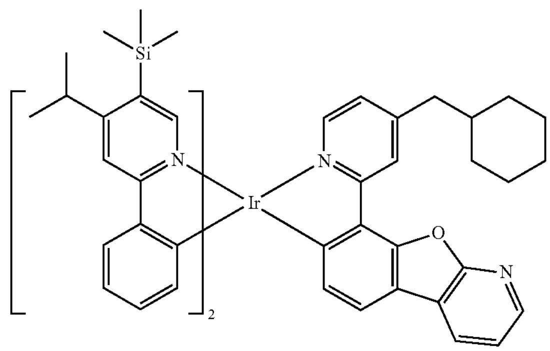
30
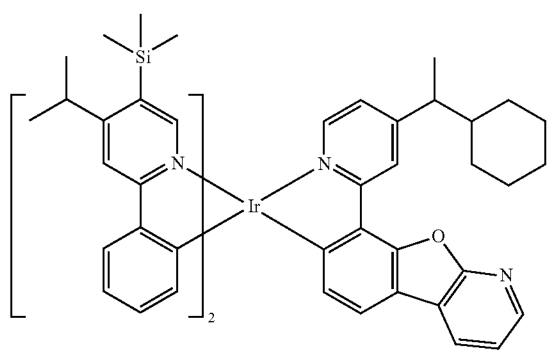
31
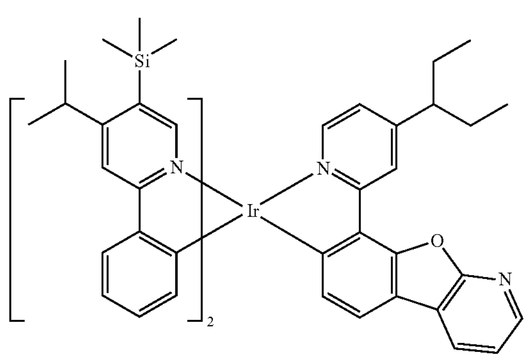

-continued
32
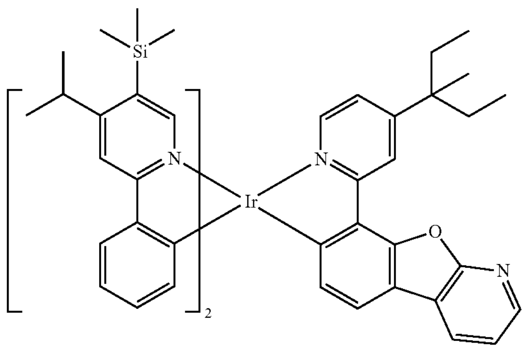
33
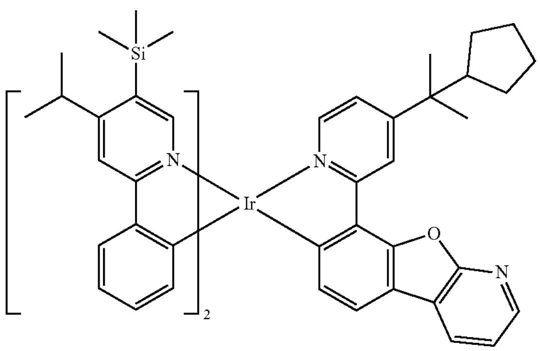
34
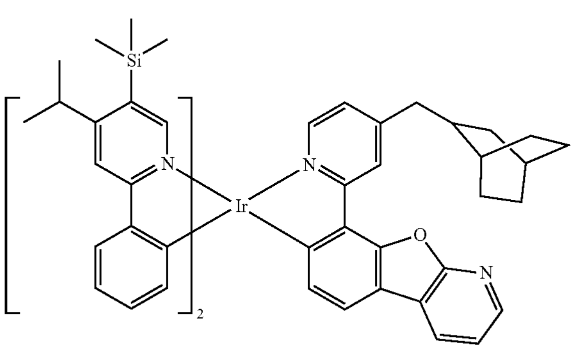
35
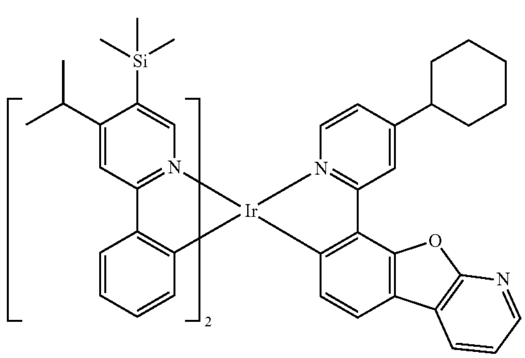
-continued
36
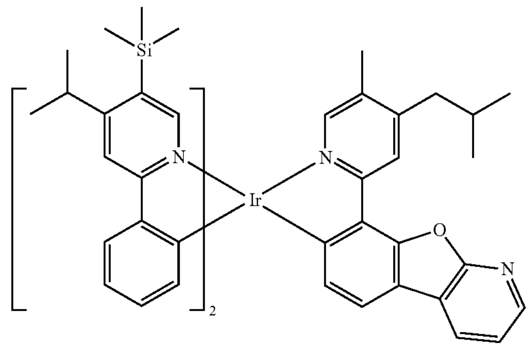
37
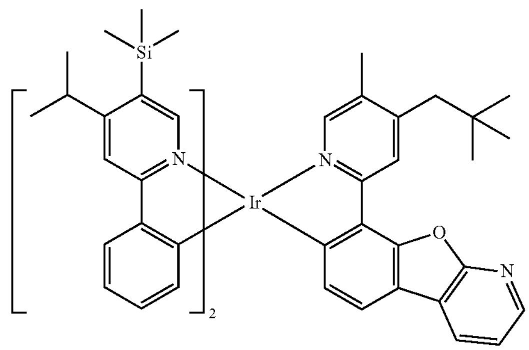
38
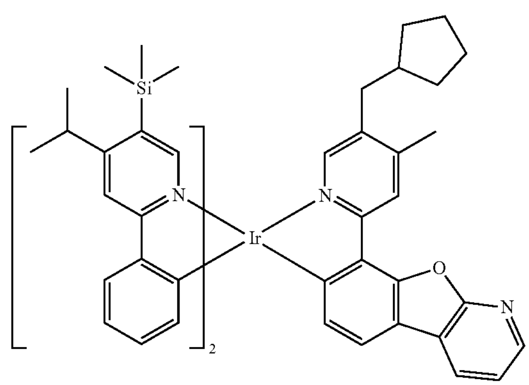
39
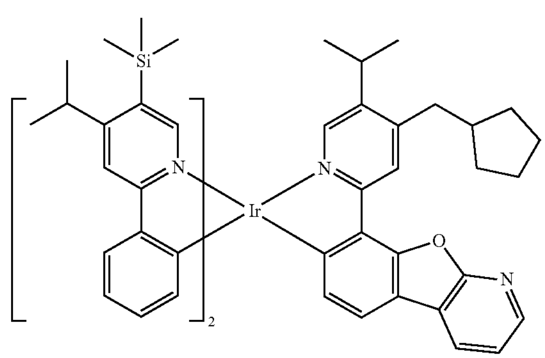

-continued
40
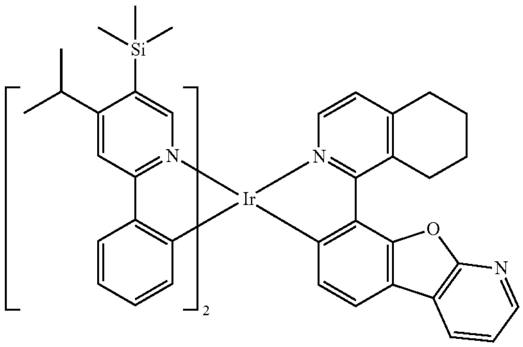
41
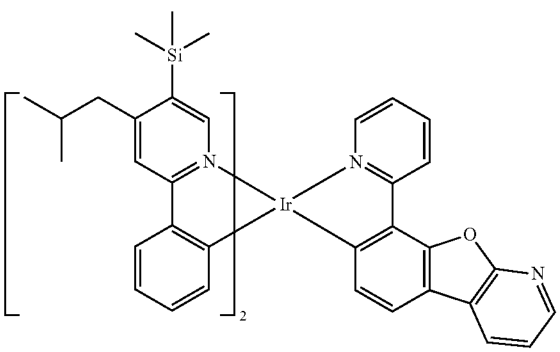
42
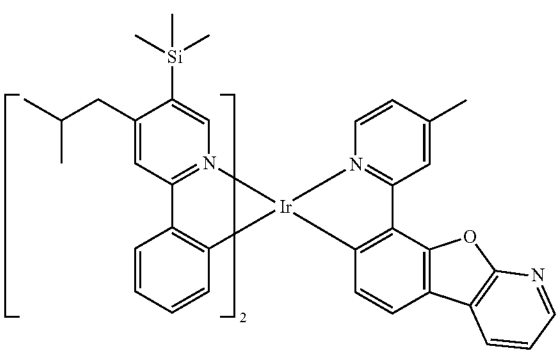
43
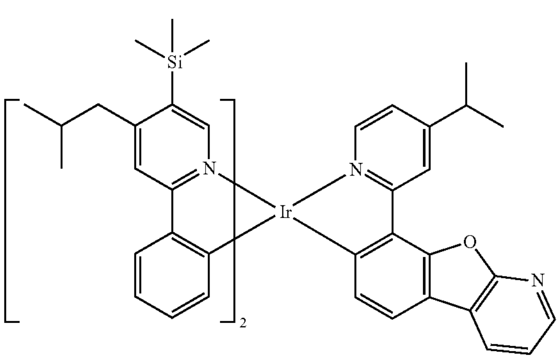
-continued
44
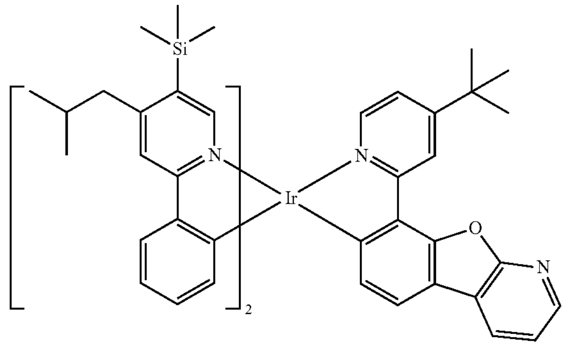
45
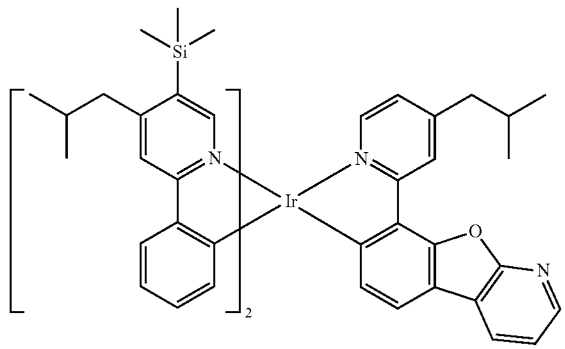
46
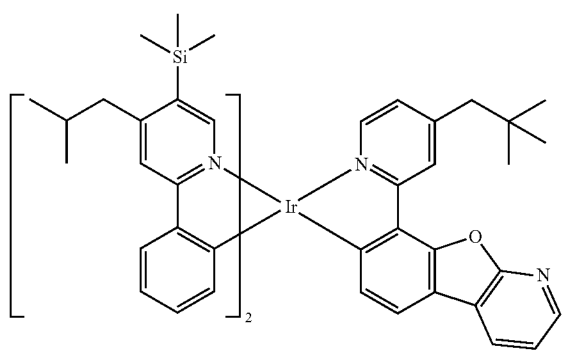
47
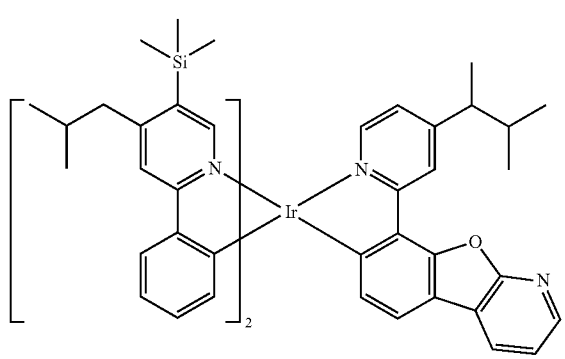

-continued
48
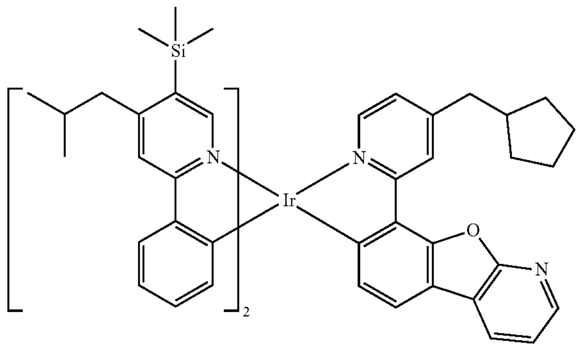
49
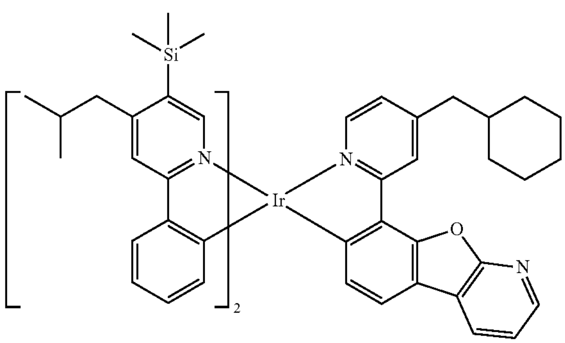
50
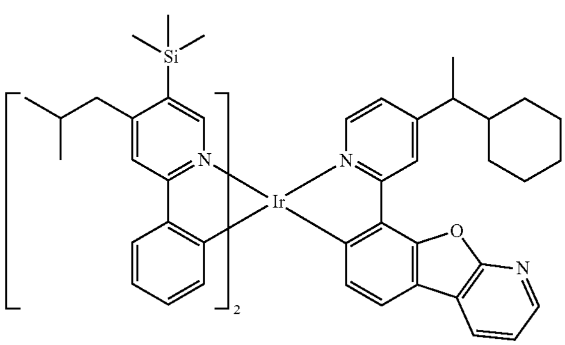
51
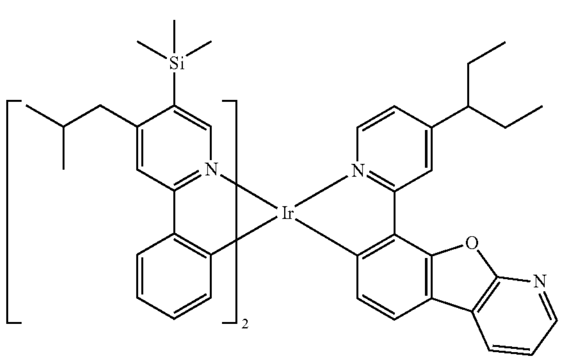
-continued
52
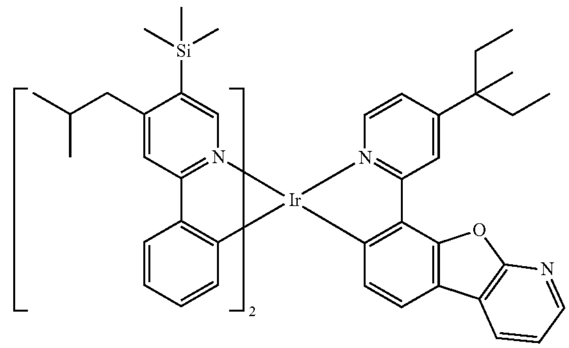
53
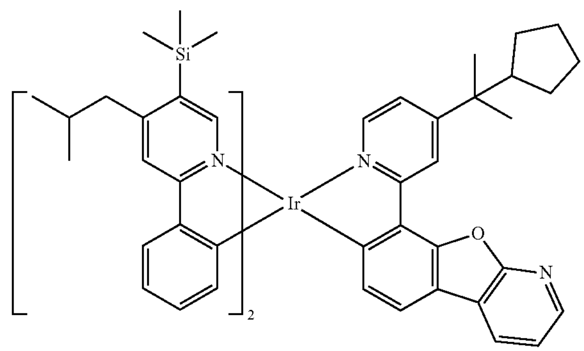
54
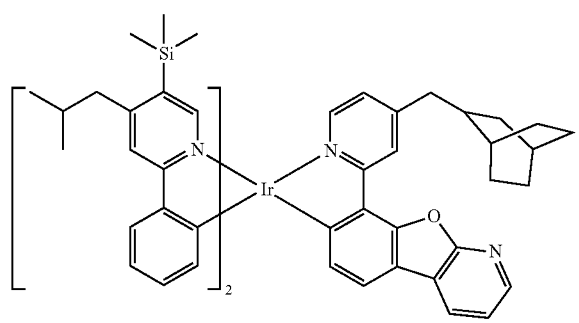
55
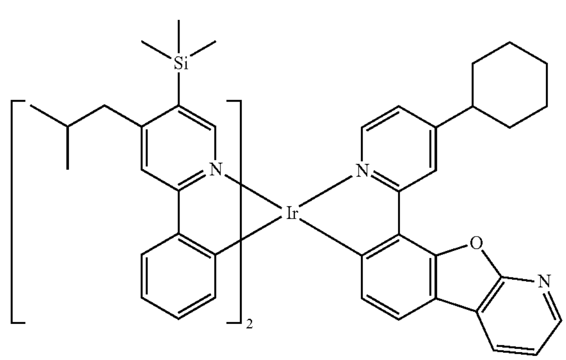

-continued
56
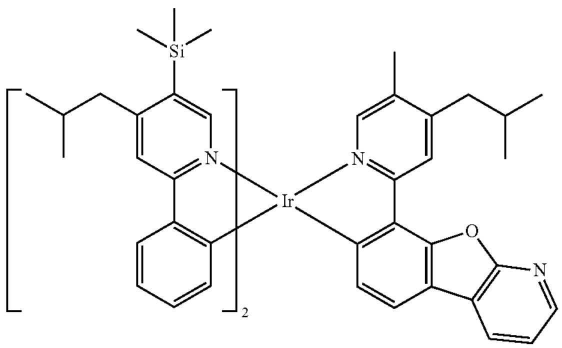
57
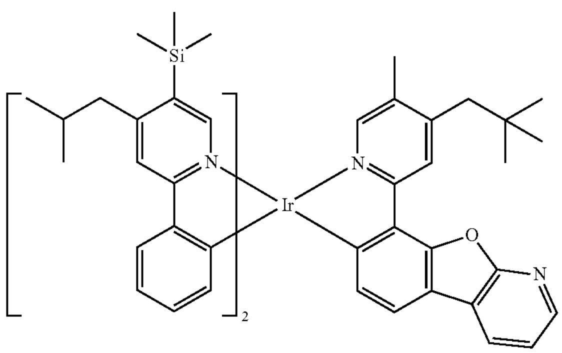
58
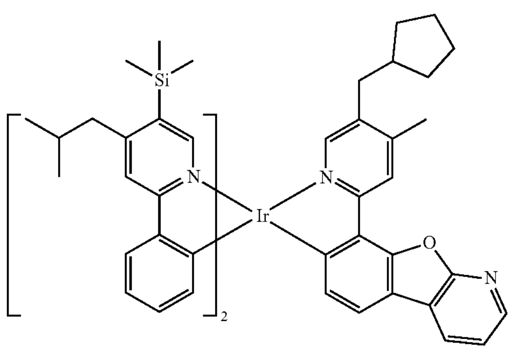
59
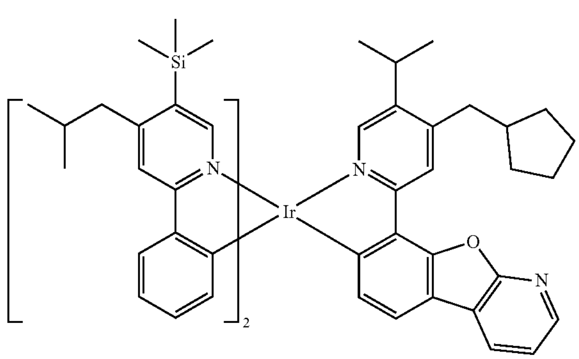
-continued
60
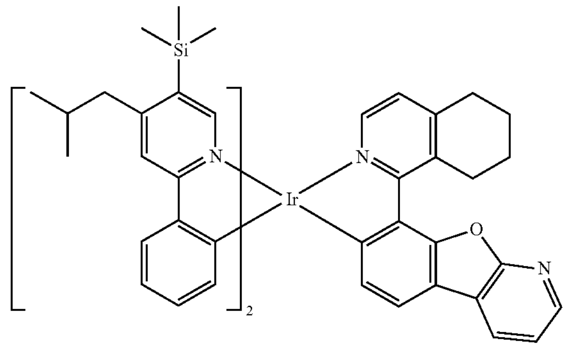
61
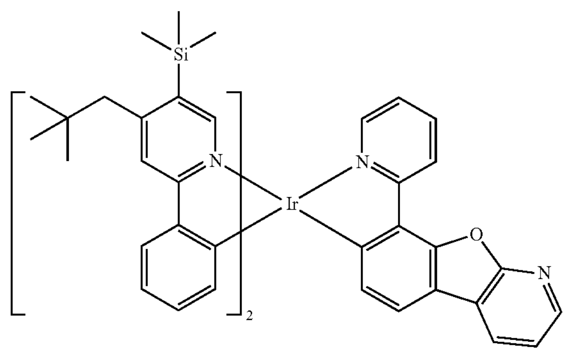
62
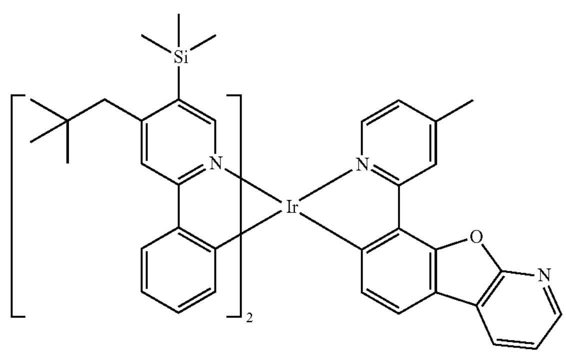
63
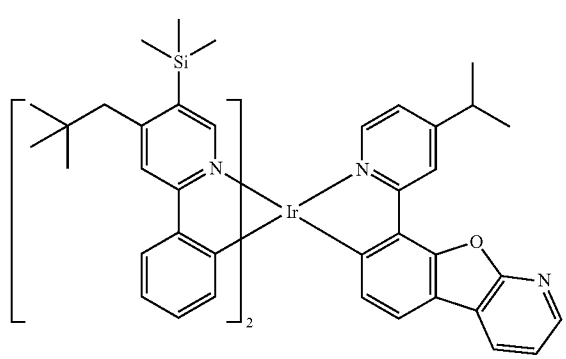

64
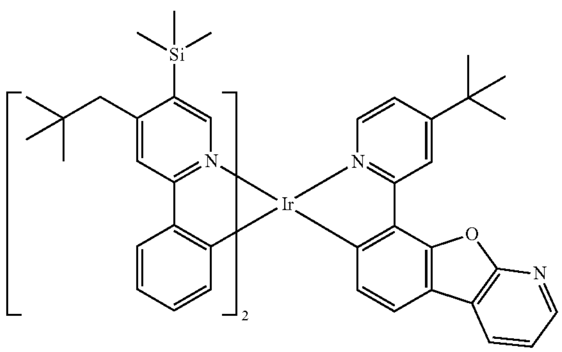
65
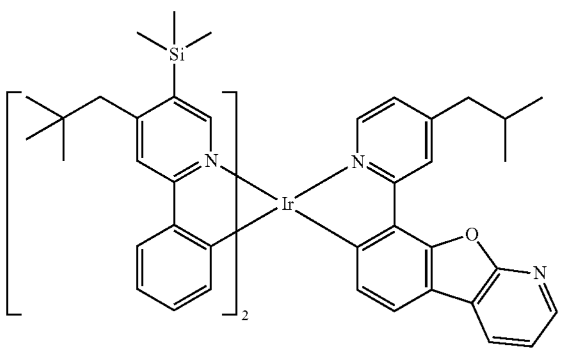
66
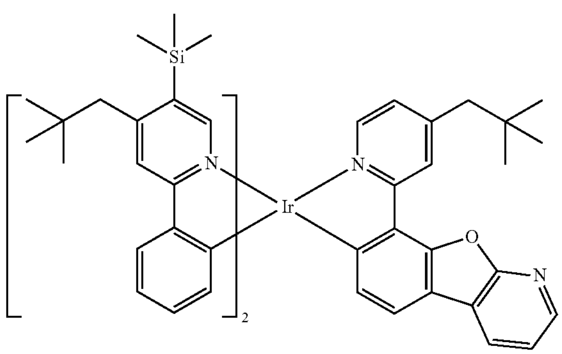
67
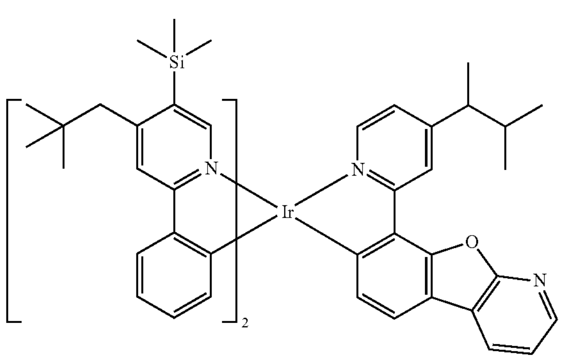
68
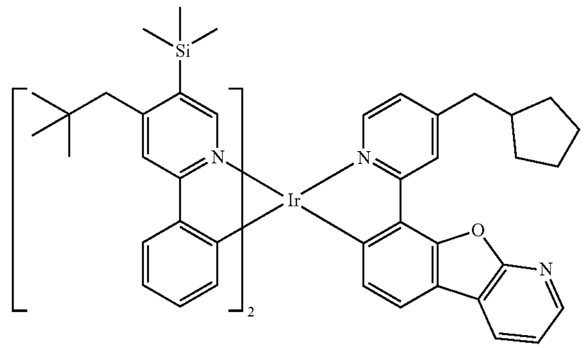
69
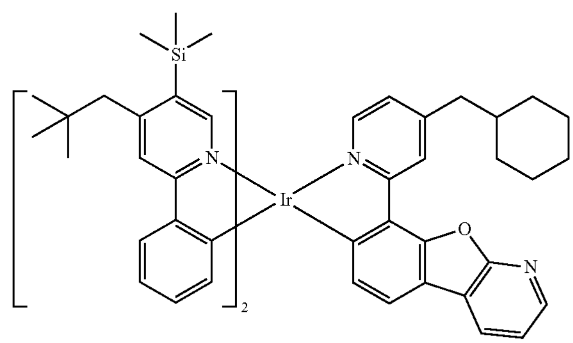
70
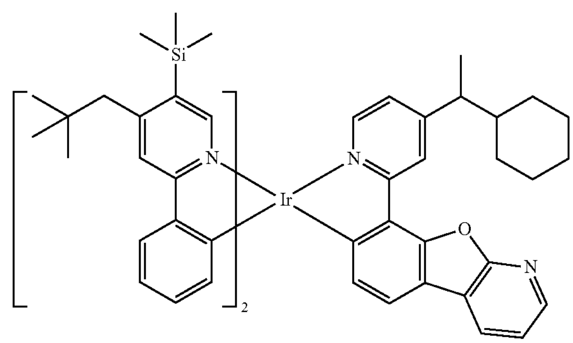
71
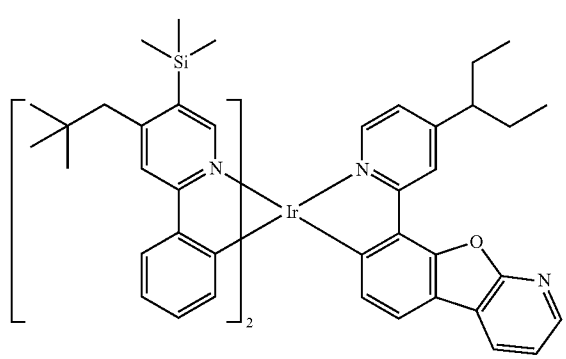

-continued
72
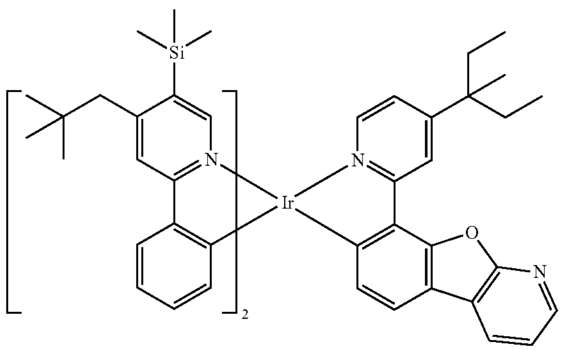
73
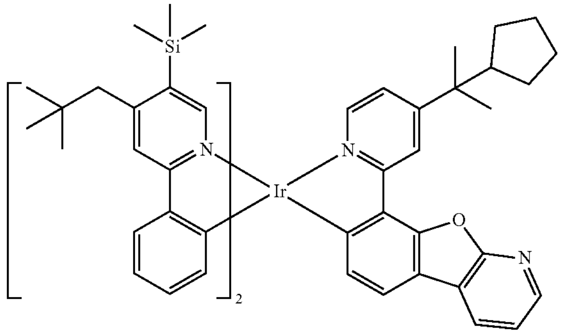
74
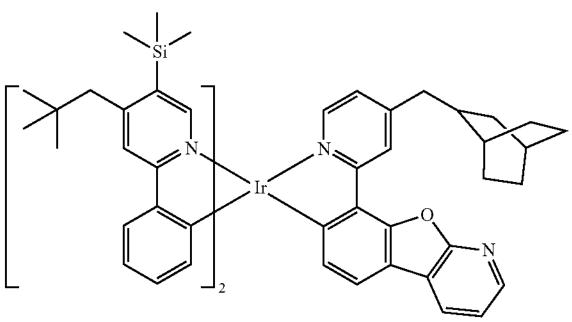
75
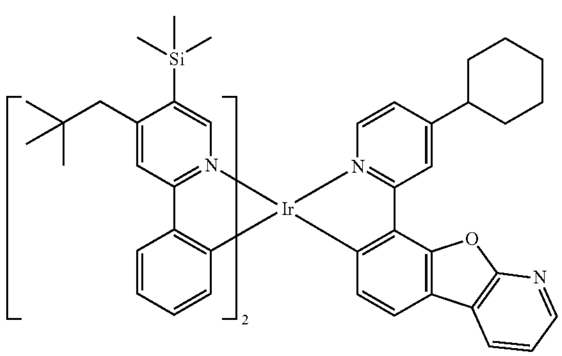
-continued
76
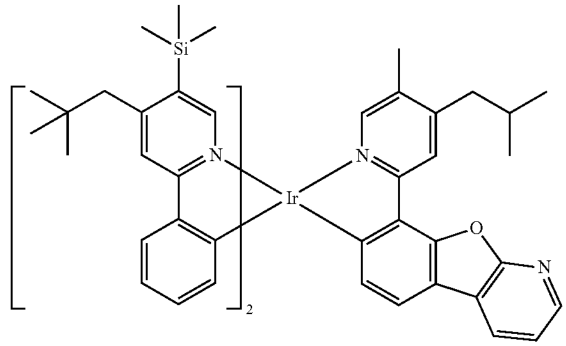
77
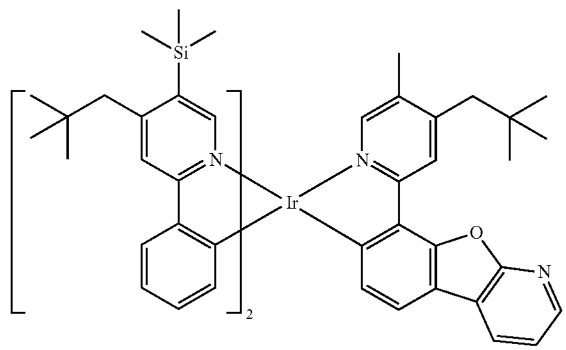
78
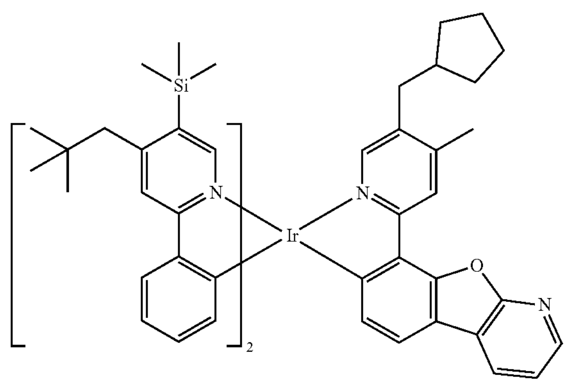
79
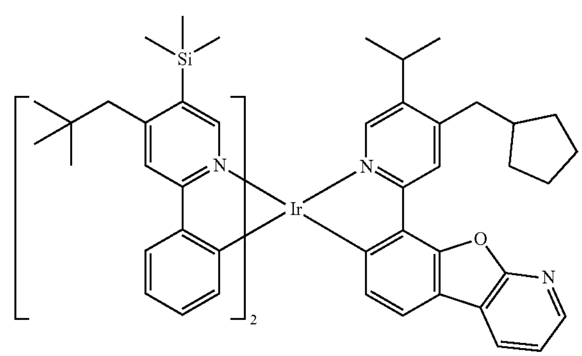

-continued
80
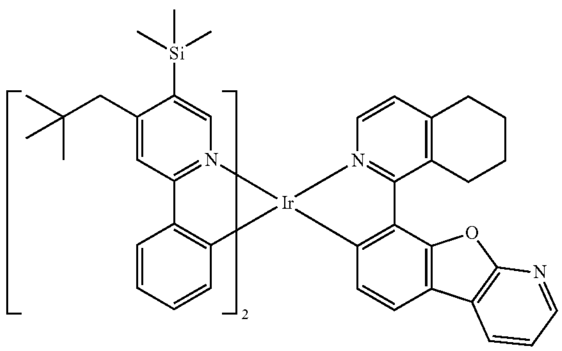
81
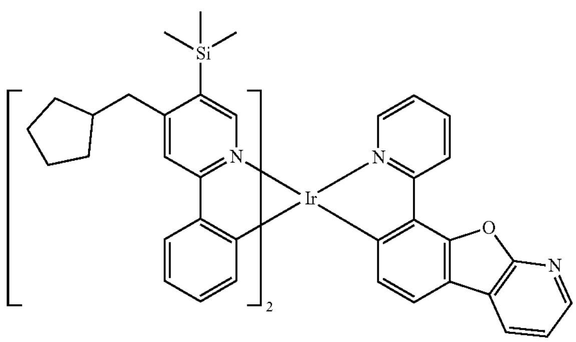
82
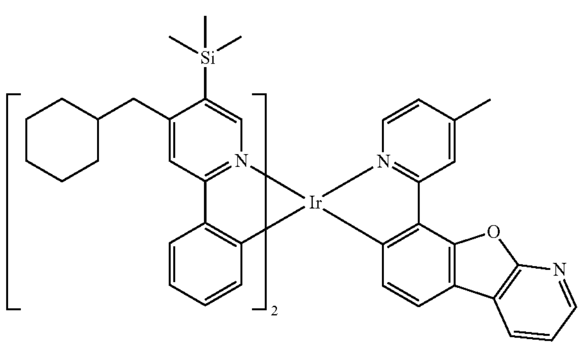
83
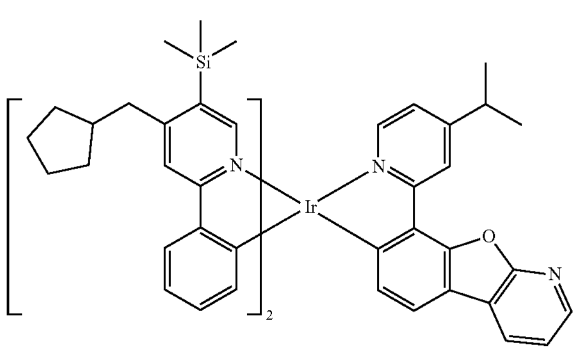
84
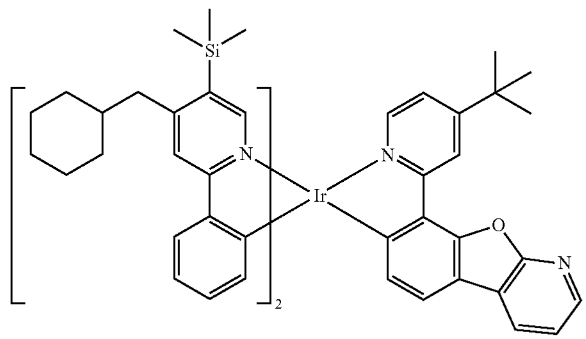
85
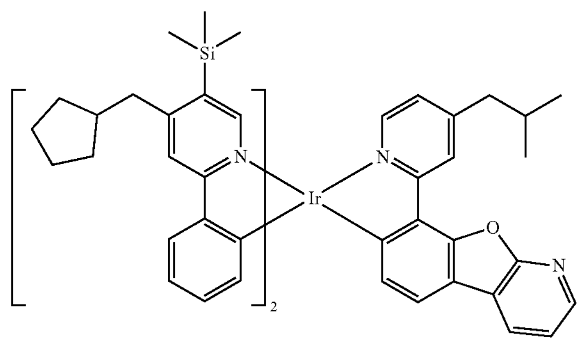
86
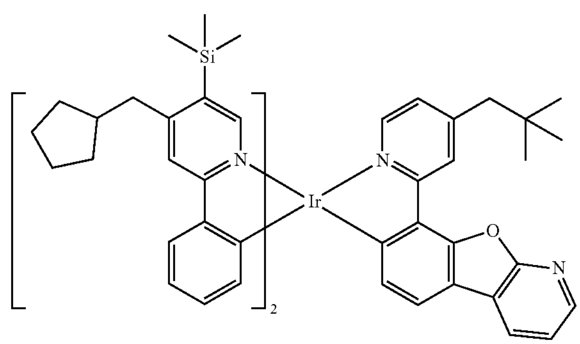
87
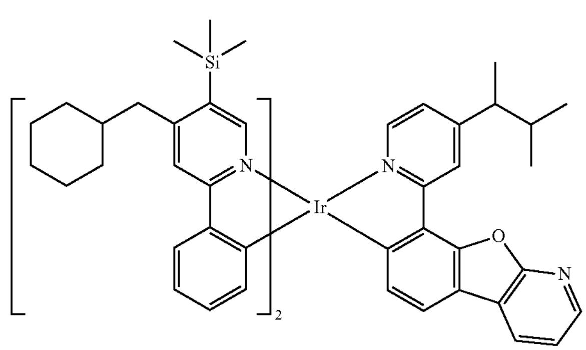

-continued
88
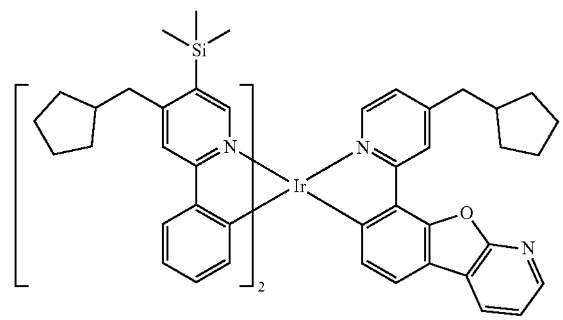
89
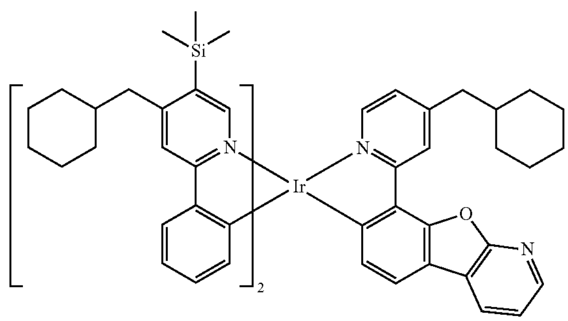
90
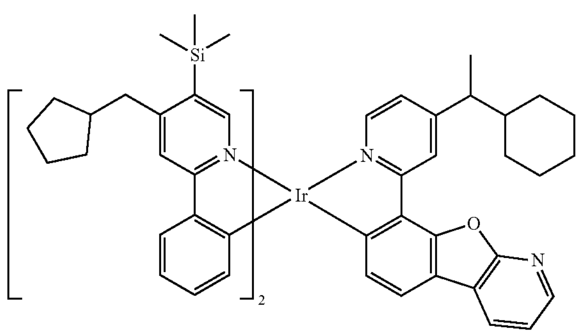
91
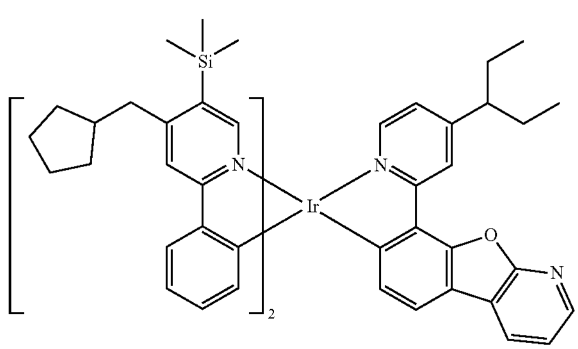
-continued
92
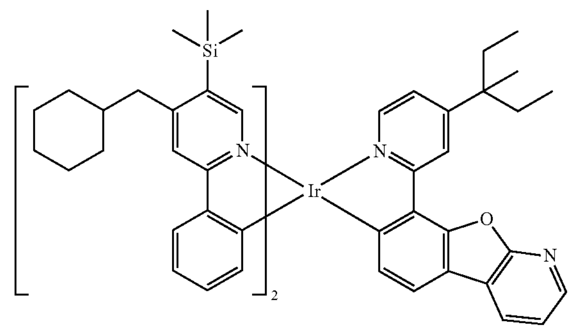
93
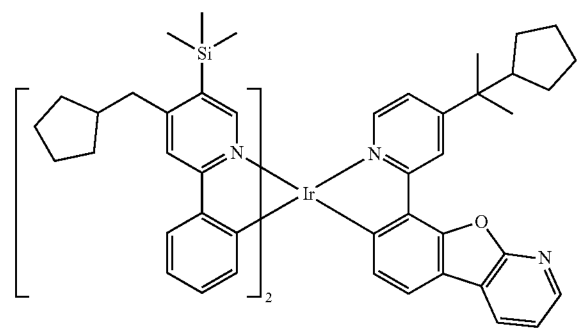
94
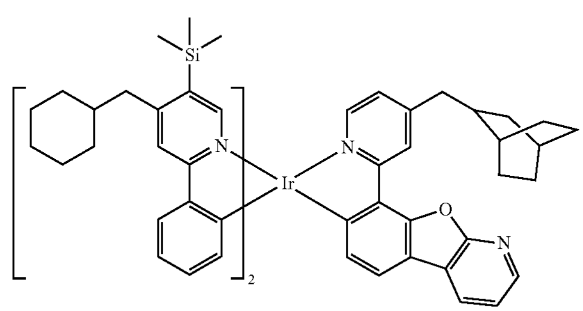
95
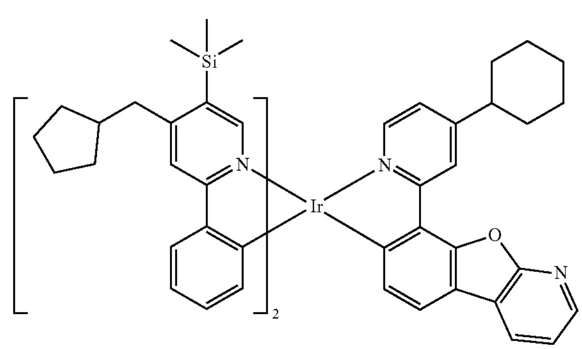

-continued
96
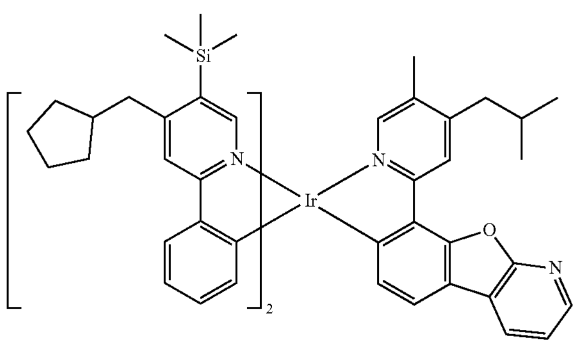
97
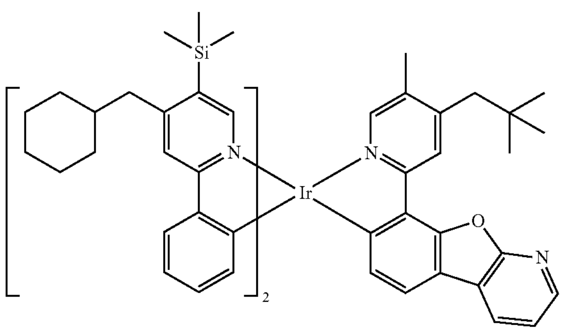
98
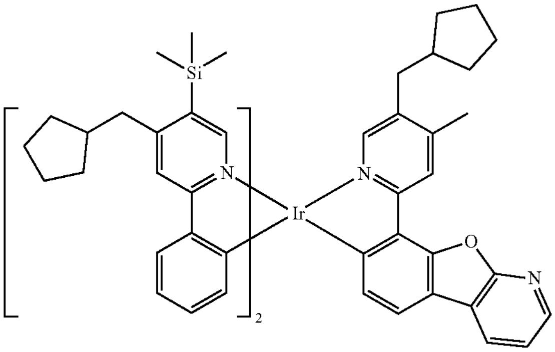
99
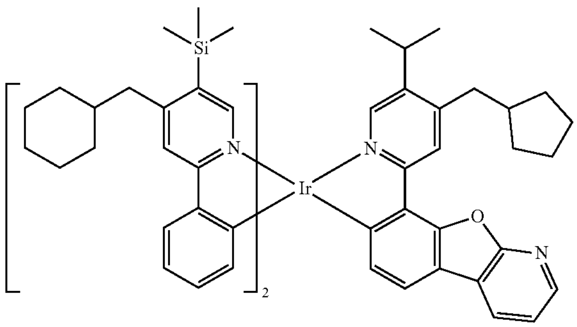
-continued
100
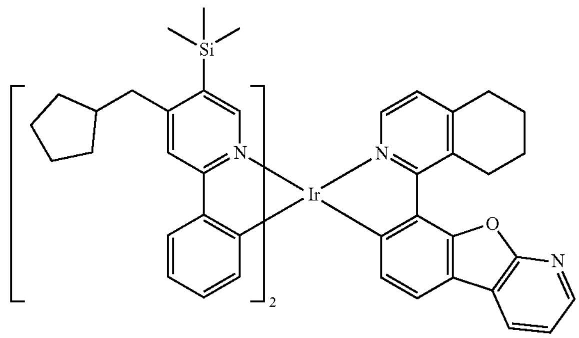
101
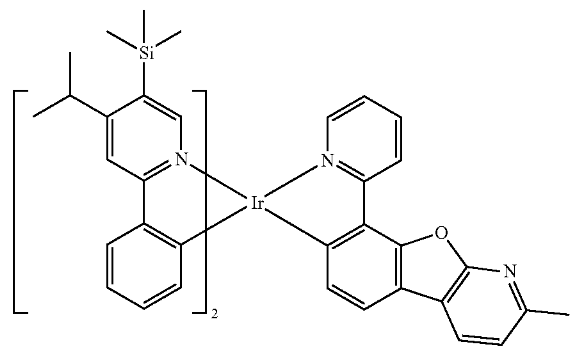
102
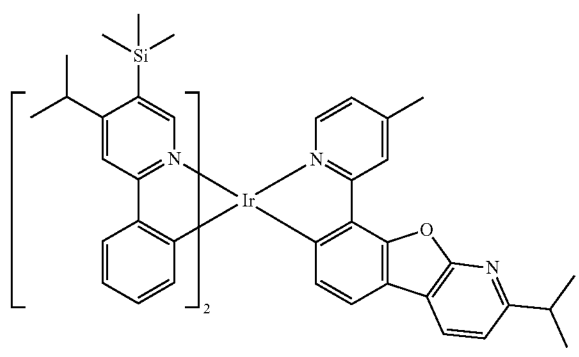
103
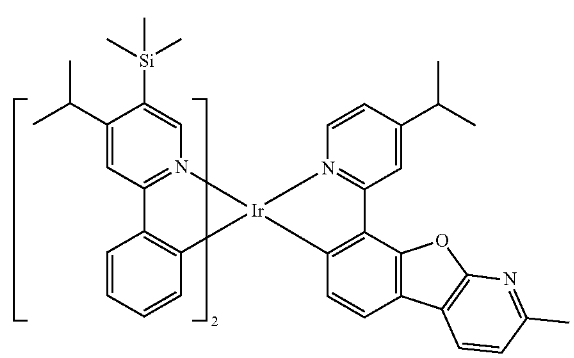

-continued
104
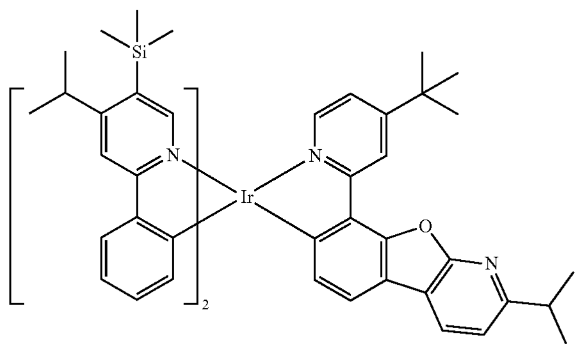
105
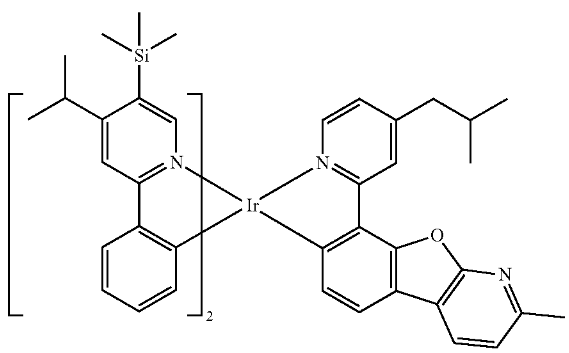
106
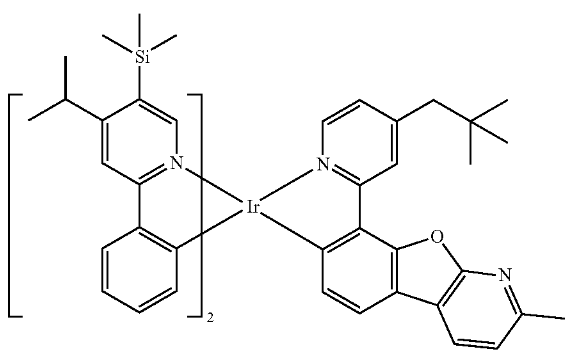
107
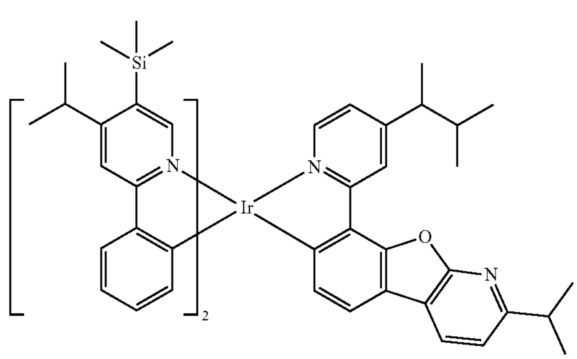
-continued
108
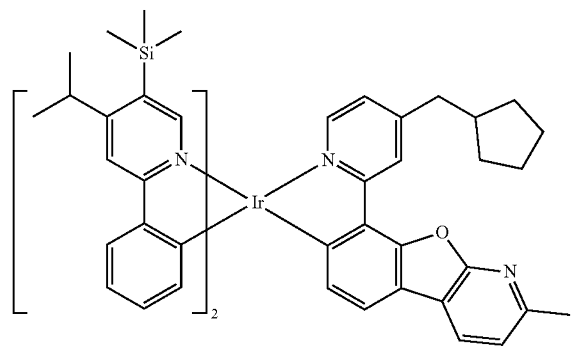
109
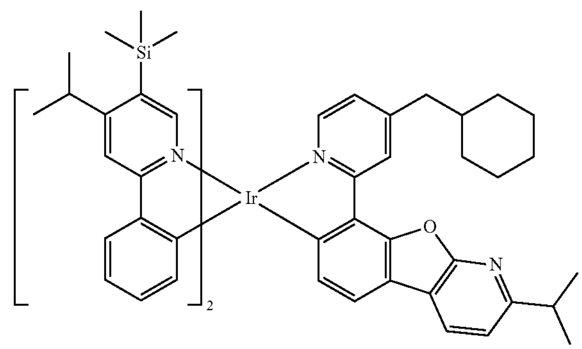
110
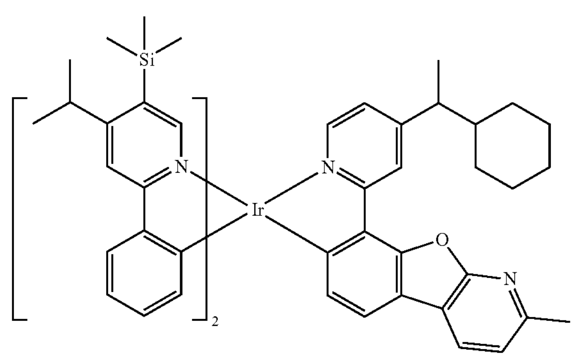
111
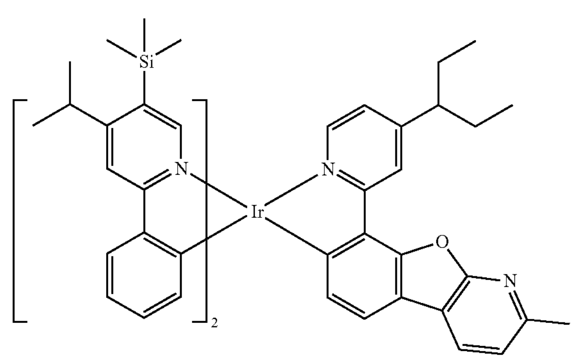

112
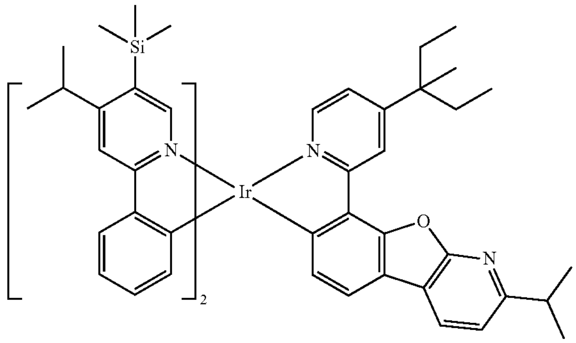
113
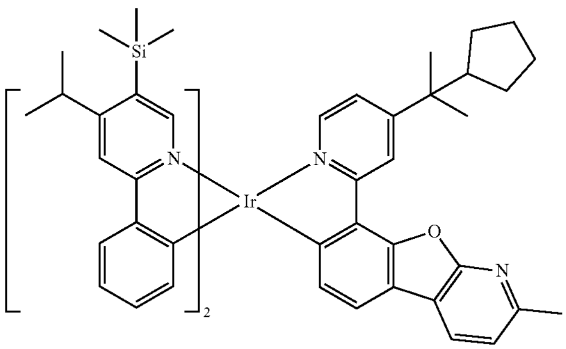
114
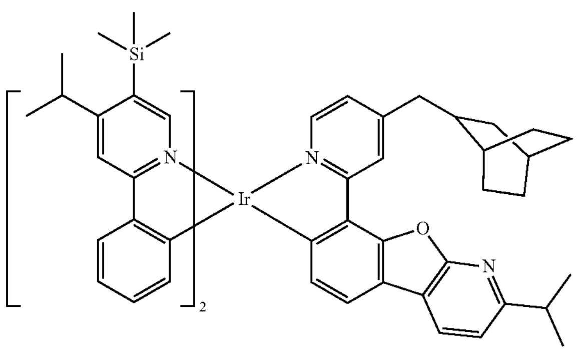
115
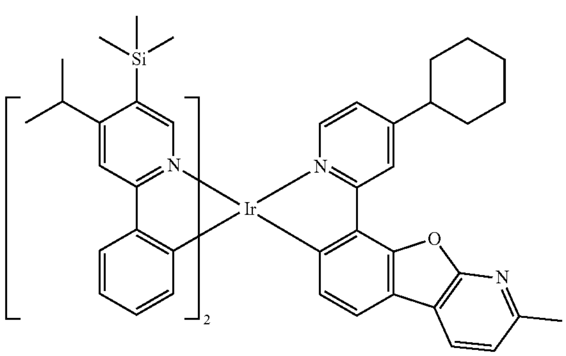
116
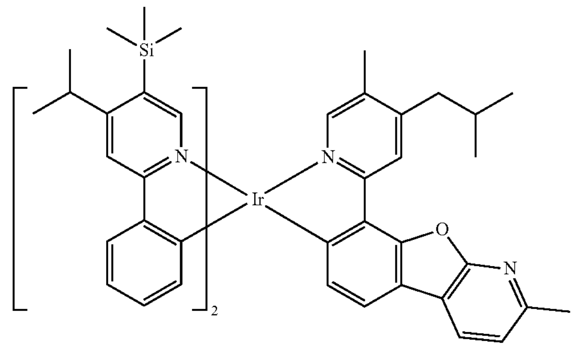
117
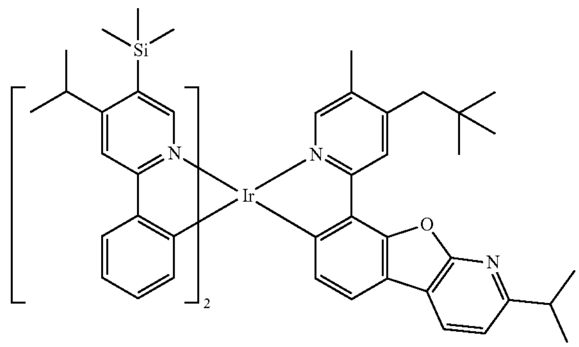
118
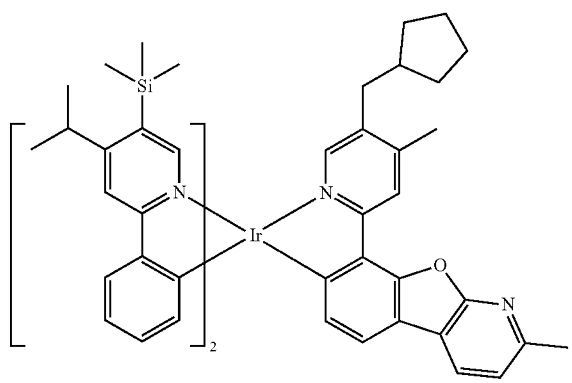
119
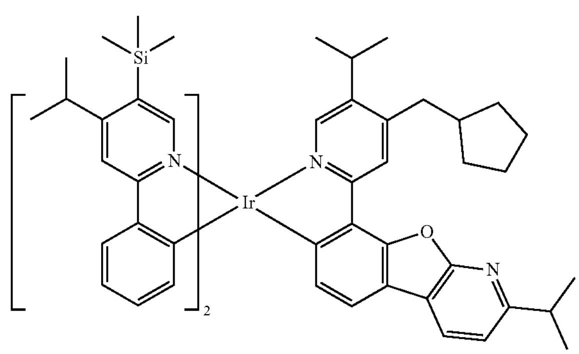

-continued
120
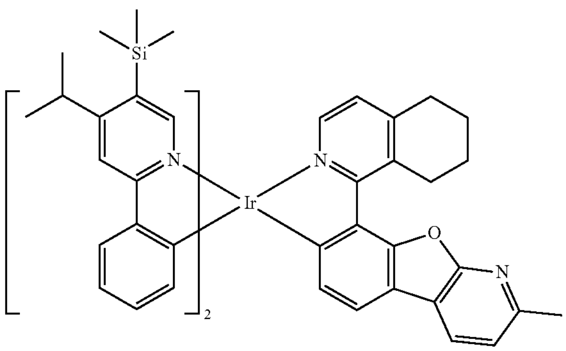
121
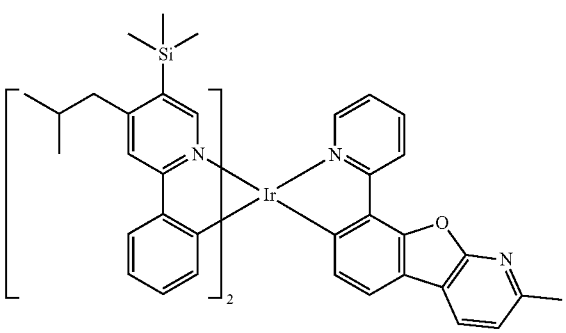
122
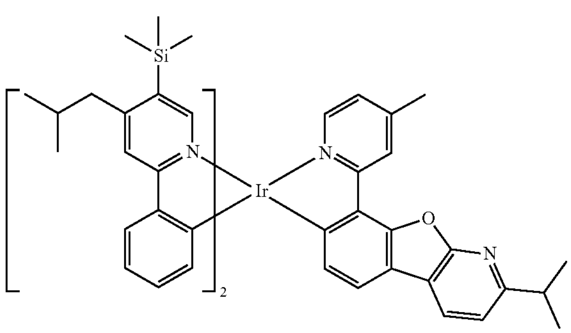
123
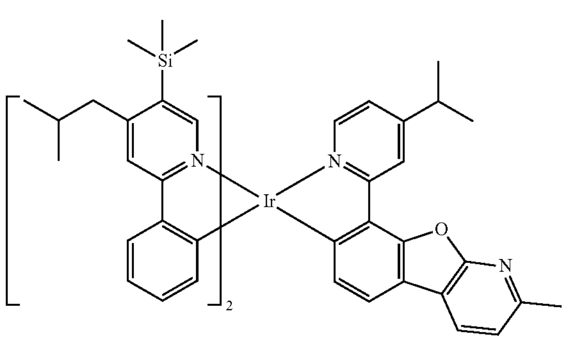
-continued
124
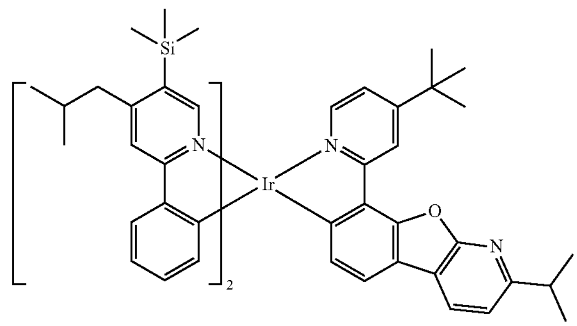
125
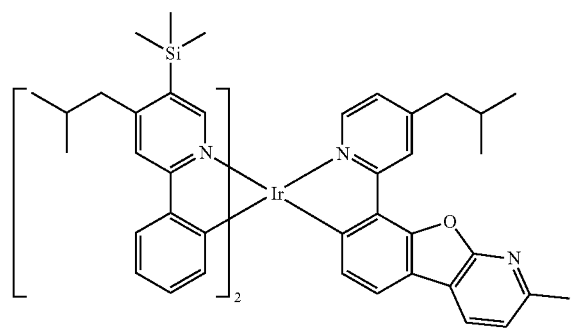
126
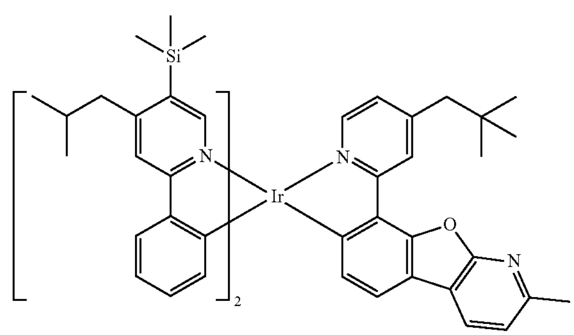
127
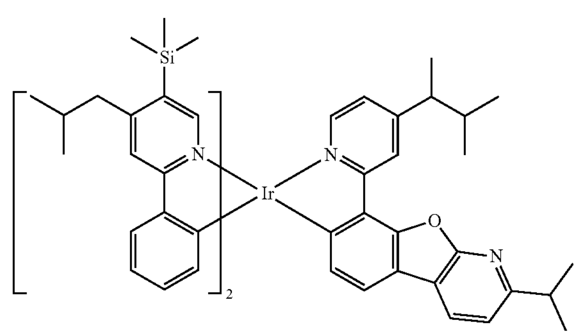

-continued
128
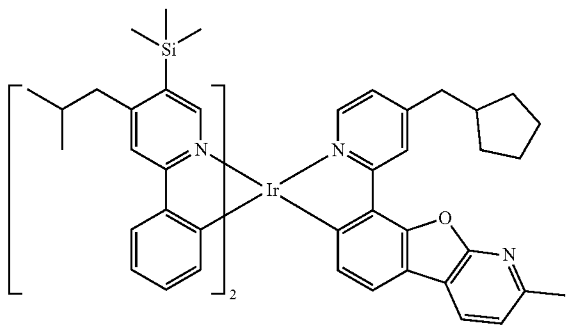
129
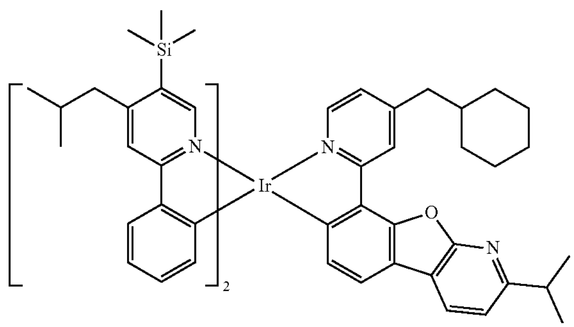
130
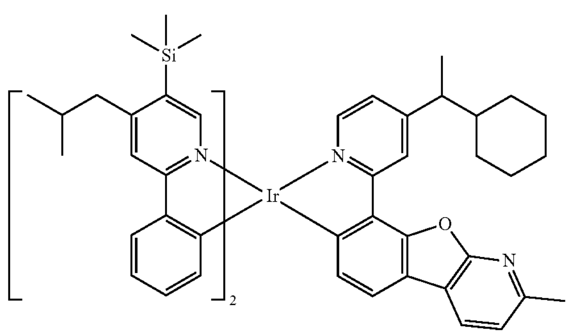
131
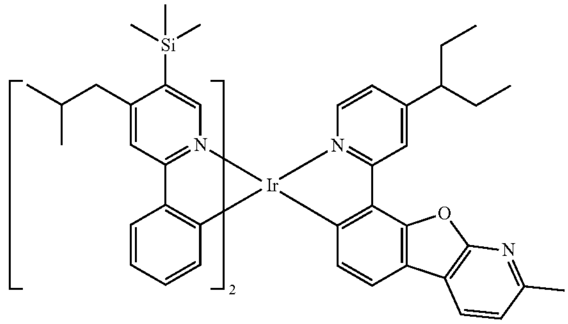
-continued
132
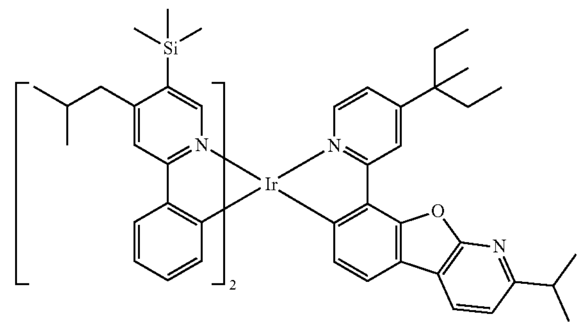
133
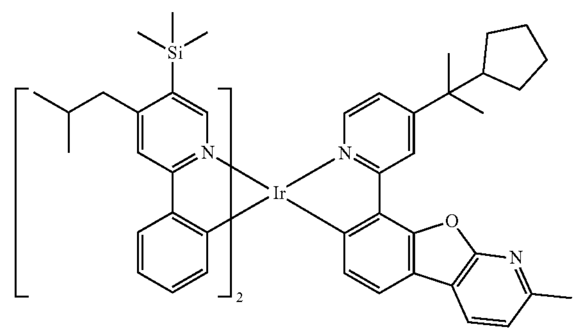
134
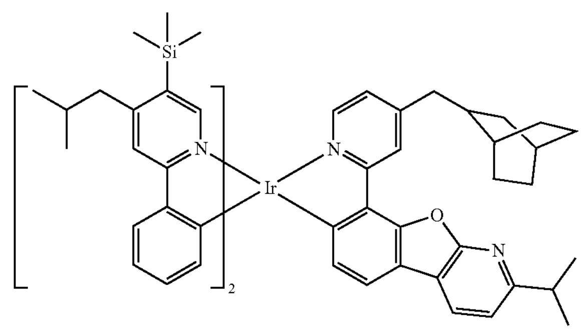
135
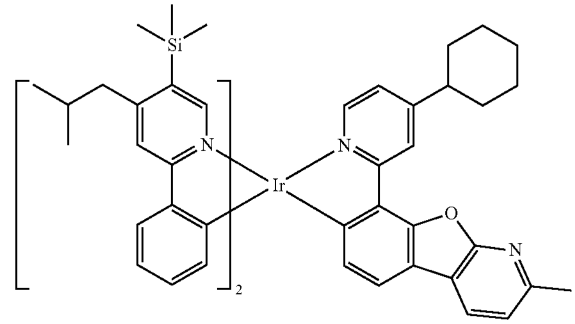

136
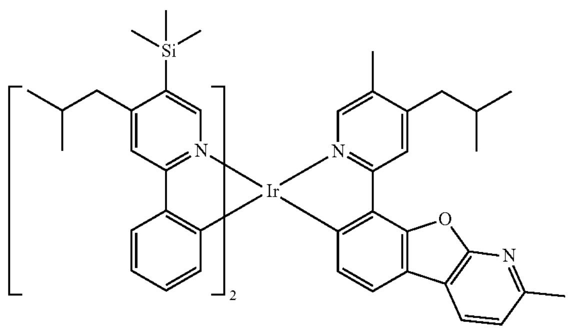
137
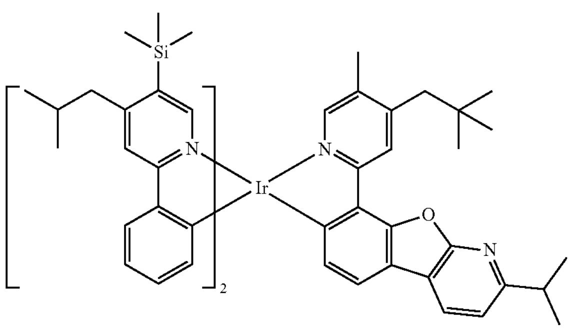
138
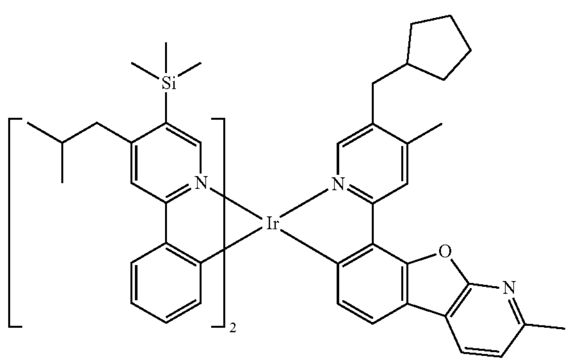
139
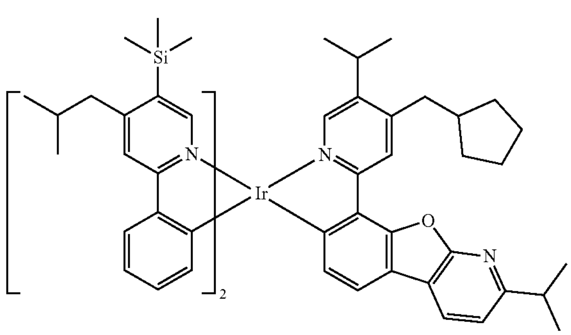
140
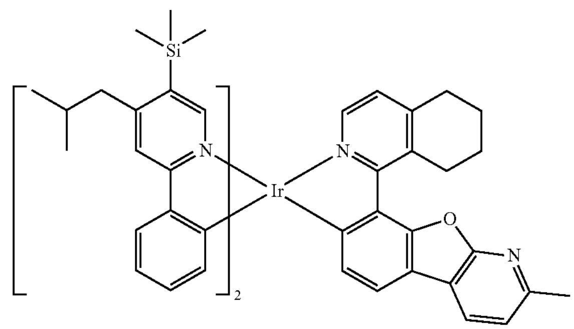
141
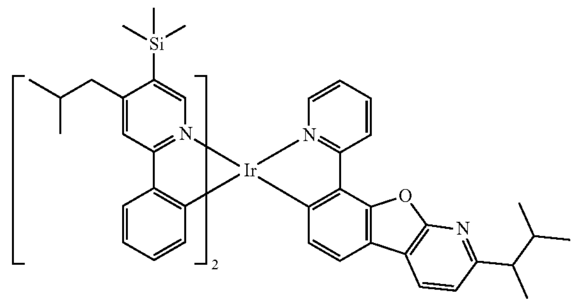
142
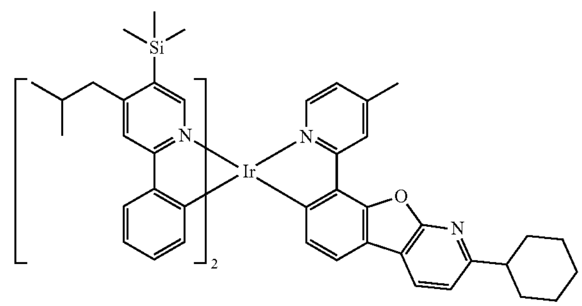
143
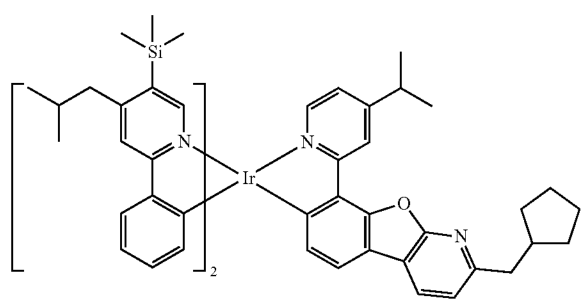
144
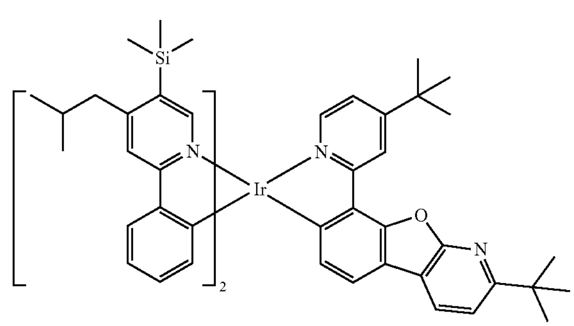

-continued
145
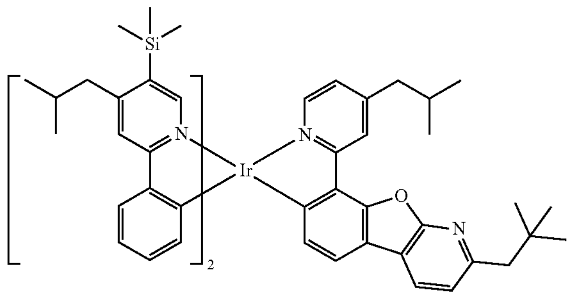
146
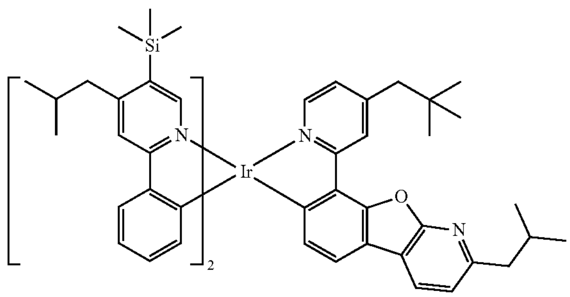
147
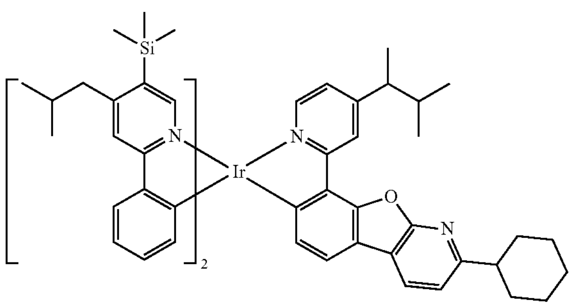
148
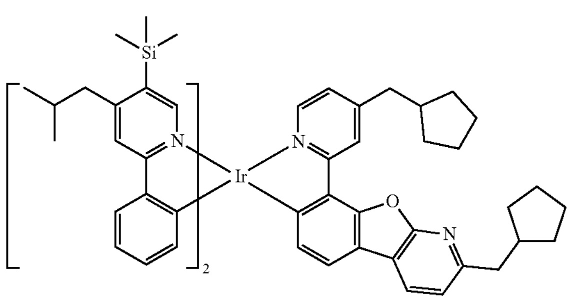
149
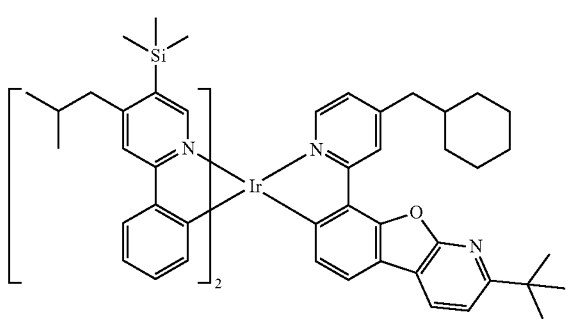
-continued
150
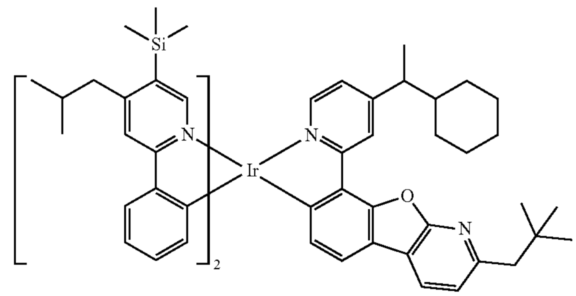
151
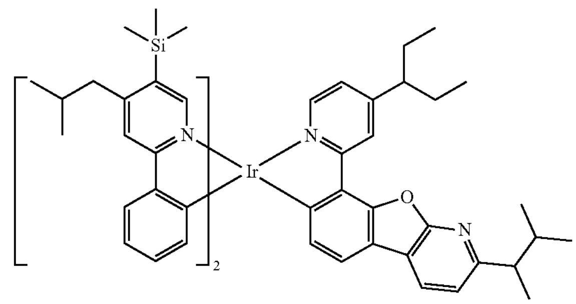
152
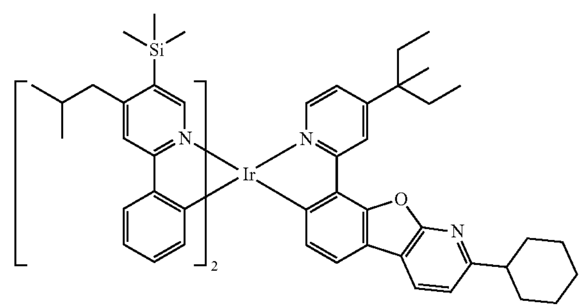
153
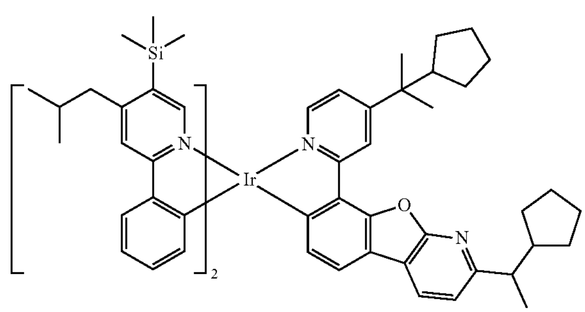
154
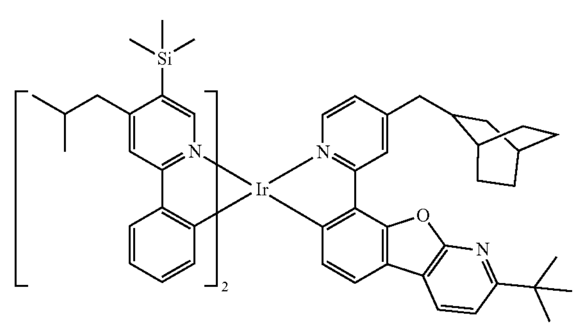

-continued
155
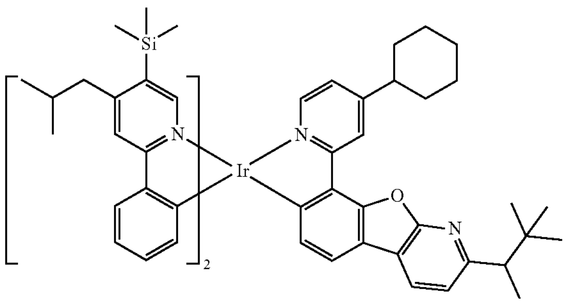
156
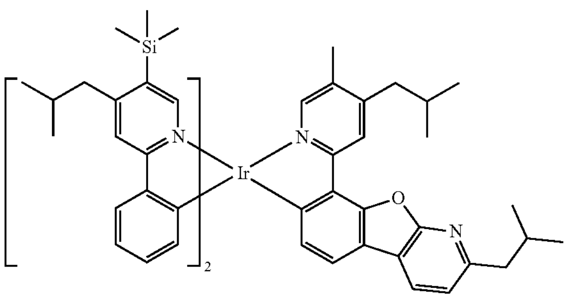
157
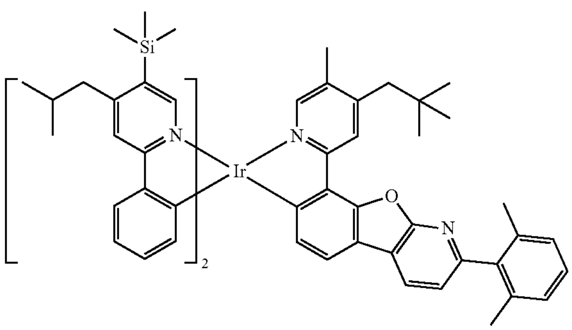
158
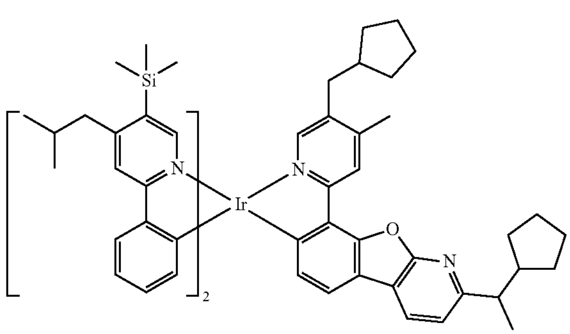
-continued
159
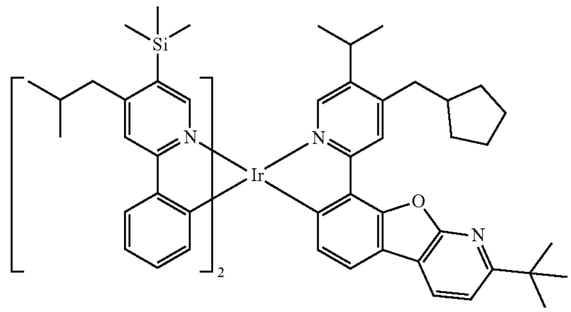
160
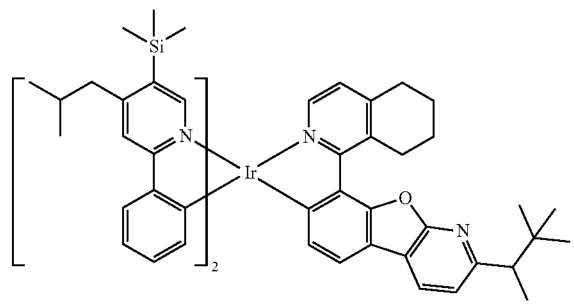
161
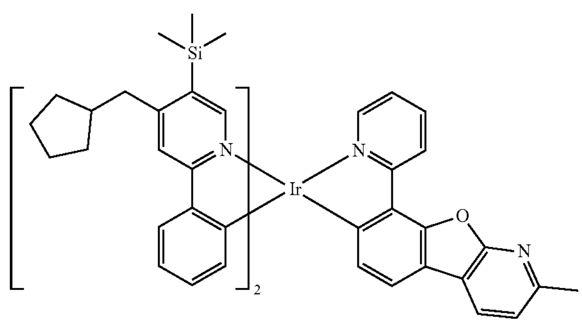
162
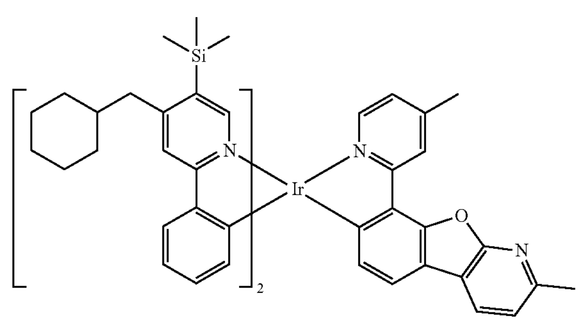

-continued
163
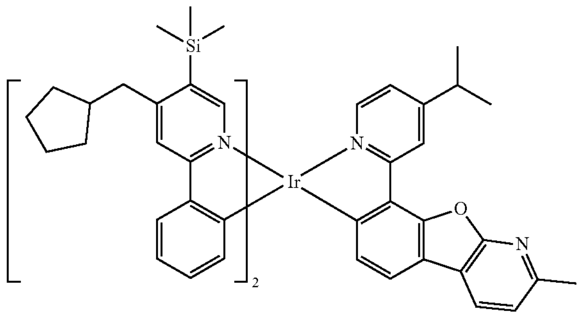
164
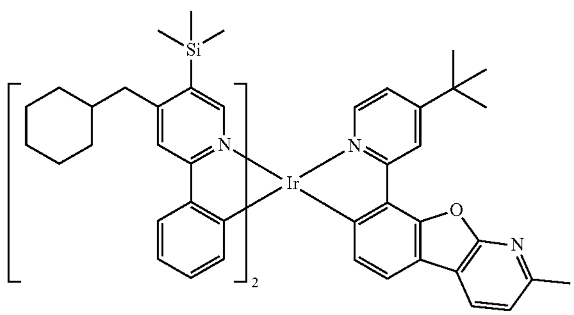
165
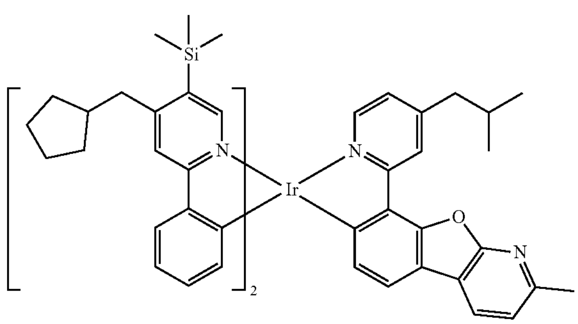
166
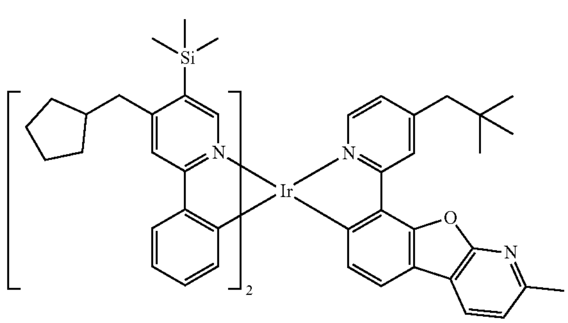
-continued
167
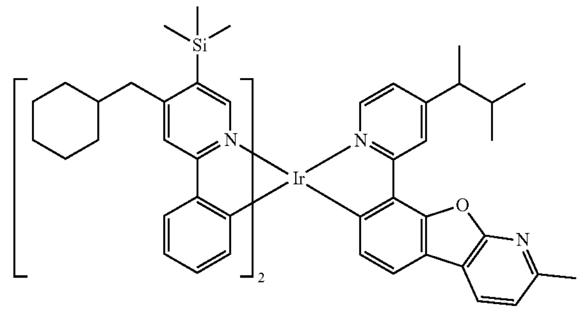
168
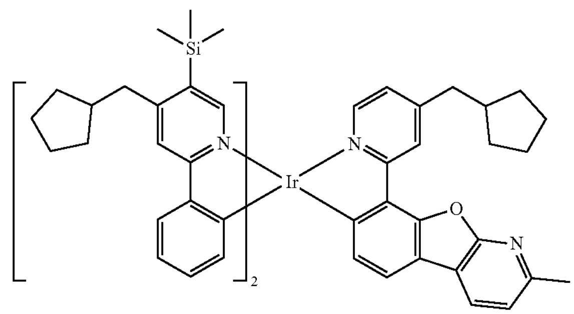
169
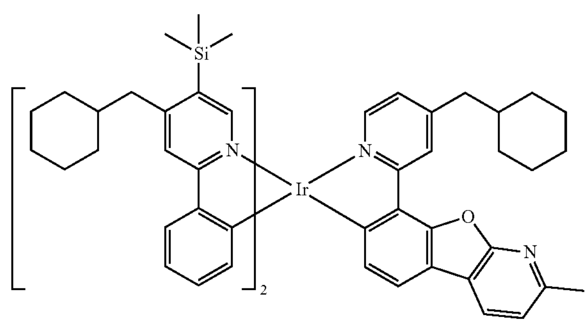
170
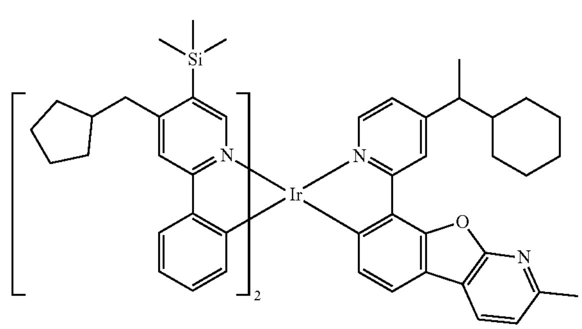

-continued
171
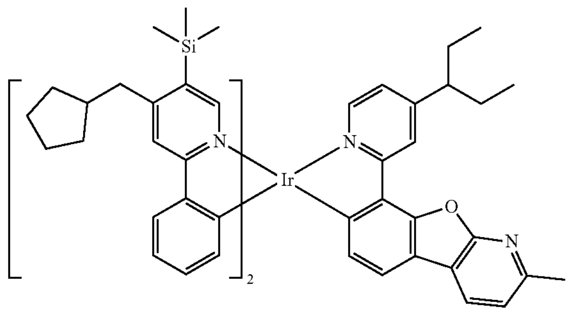
172
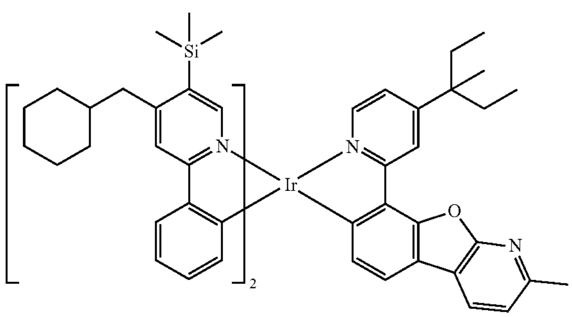
173
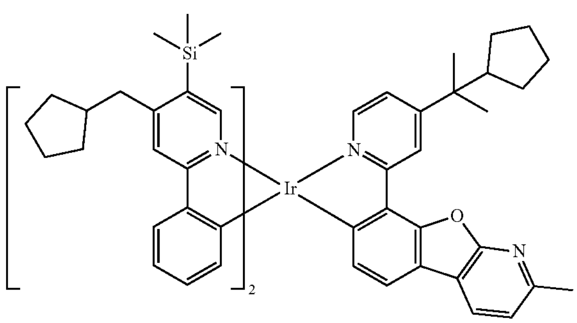
174
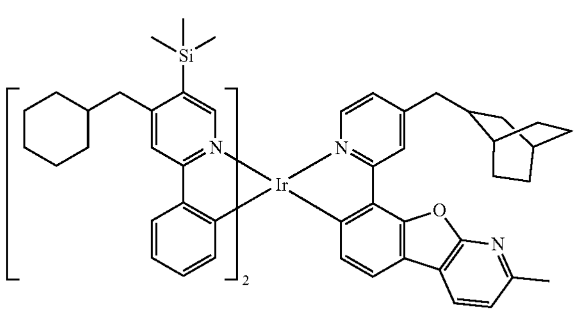
-continued
175
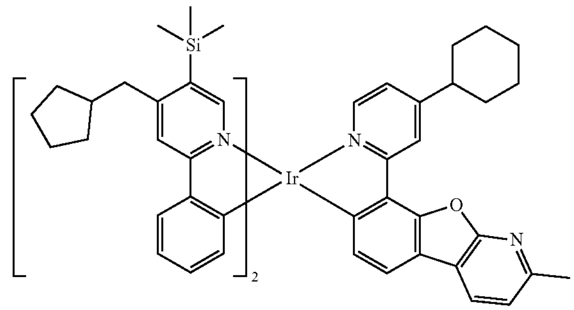
176
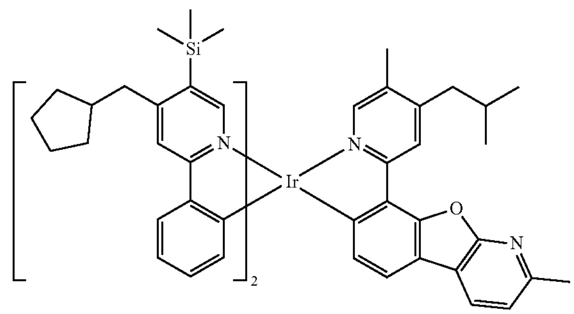
177
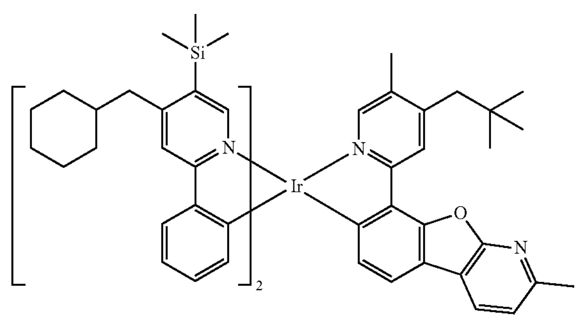
178
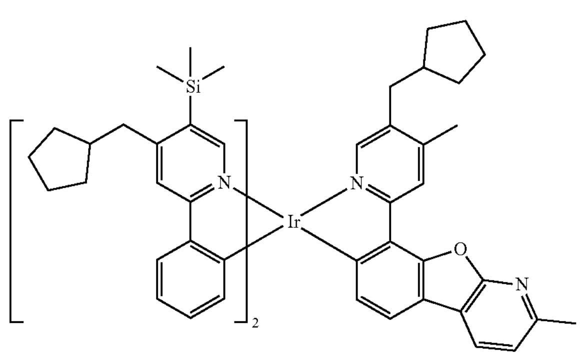

-continued
179
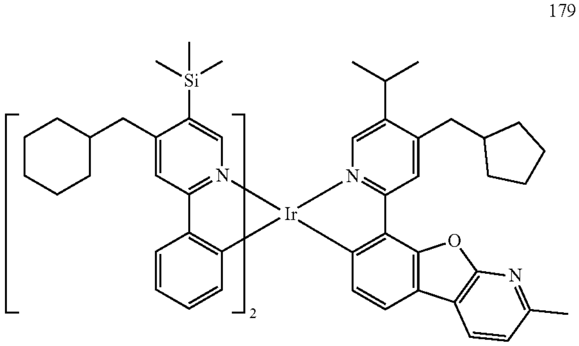
180
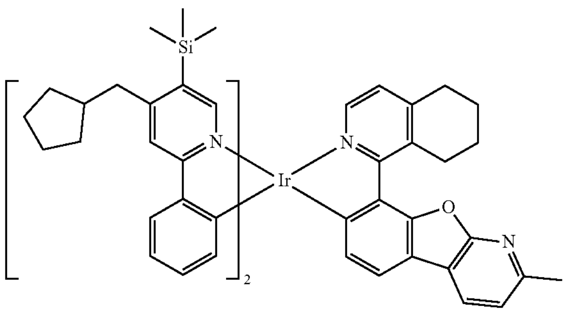
181
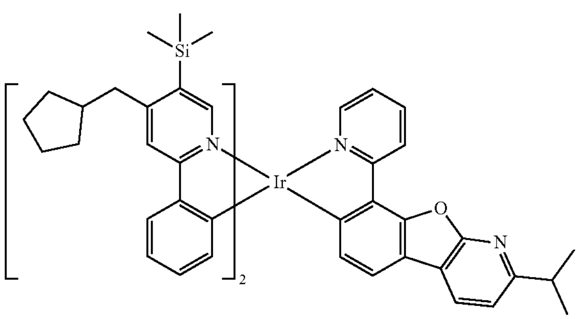
182
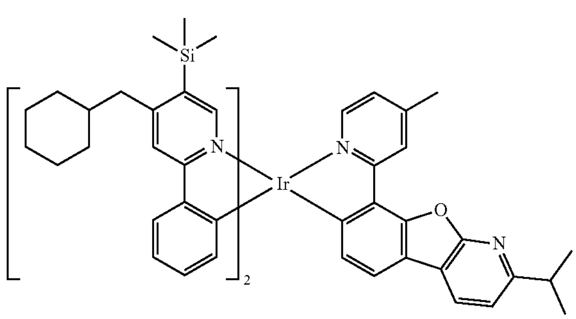
-continued
183
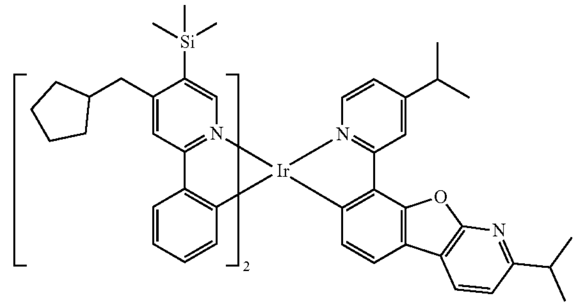
184
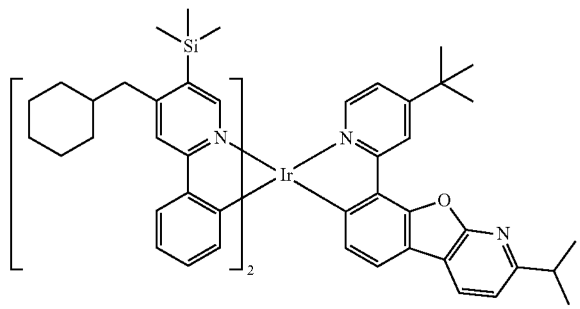
185
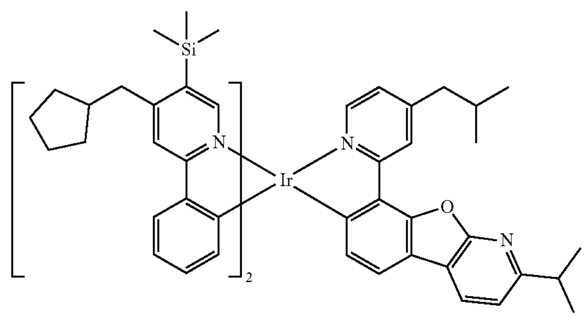
186
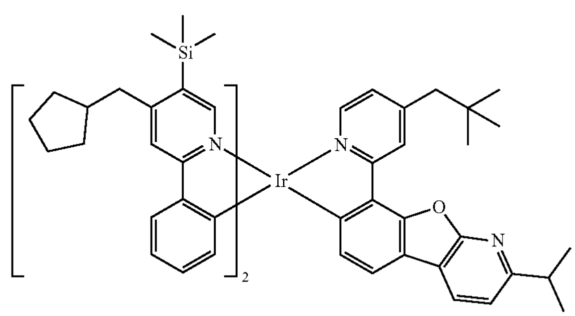
187
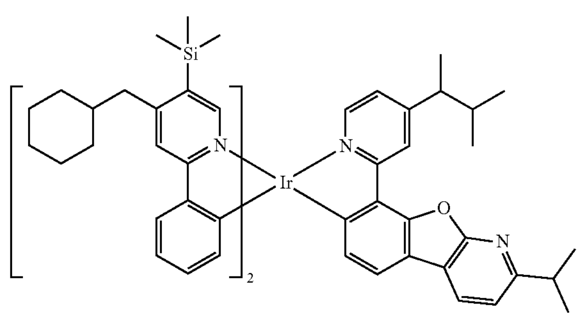

-continued
188
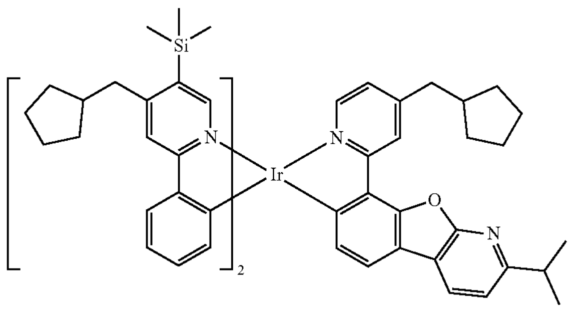
189
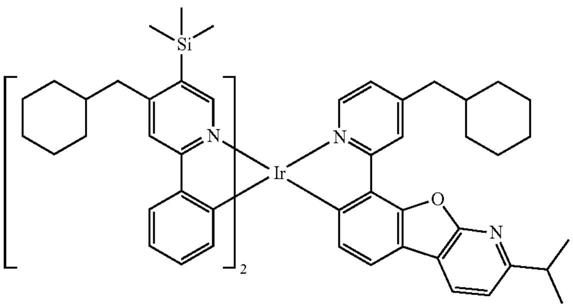
190
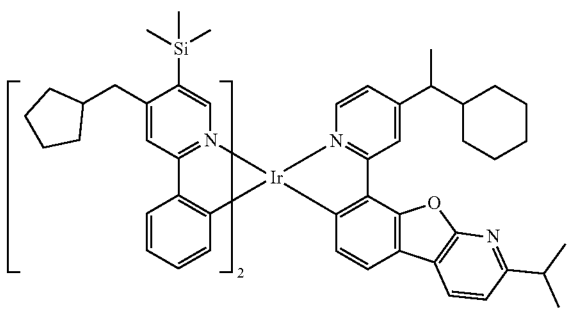
191
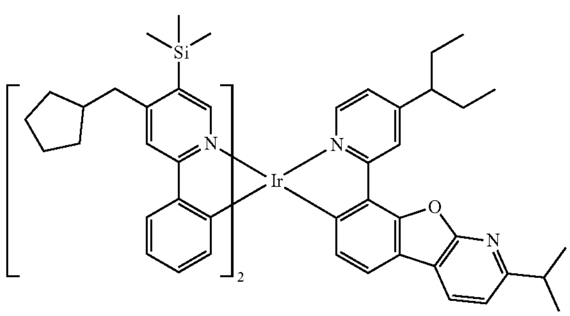
192
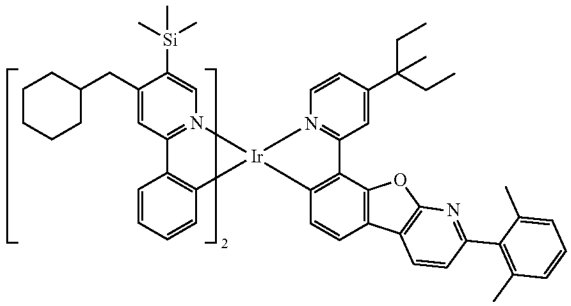
-continued
193
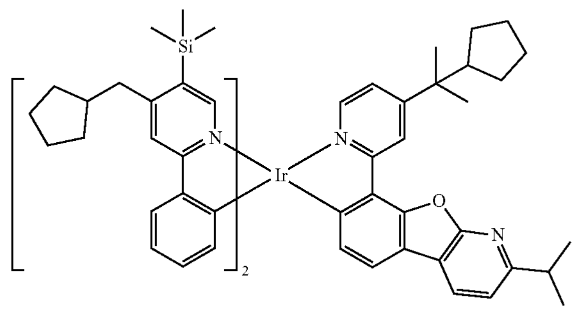
194
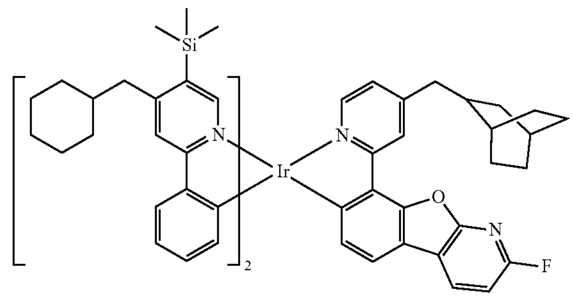
195
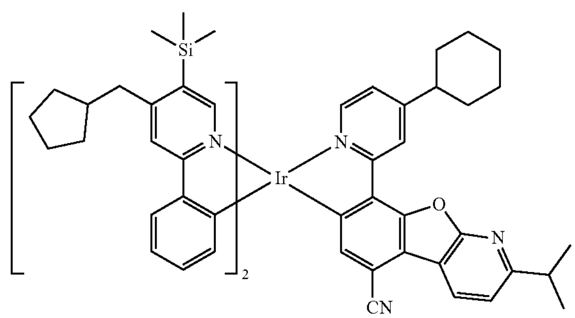
196
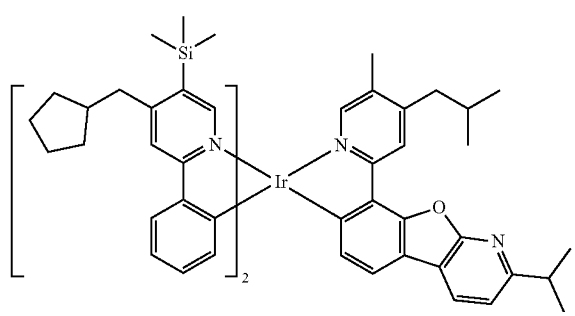
197
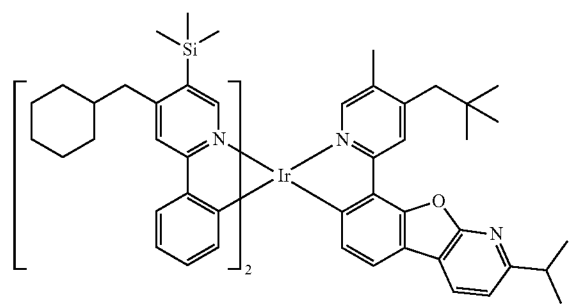

198
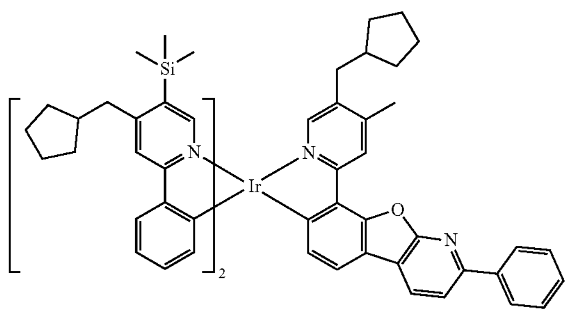
199
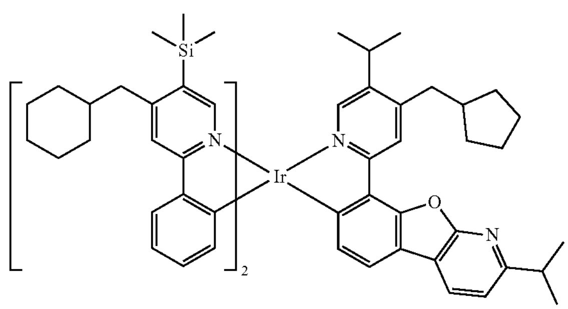
200
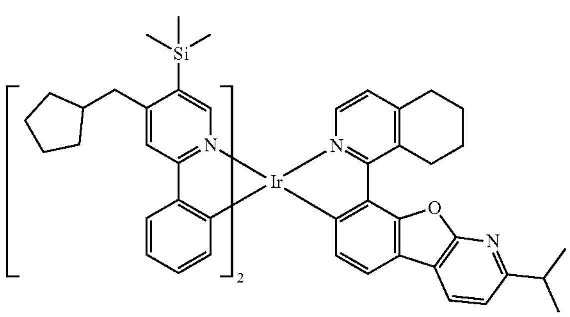
201
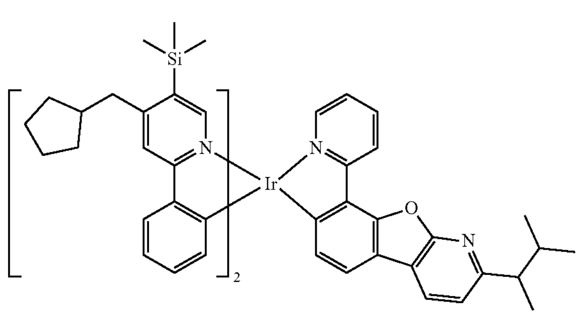
202
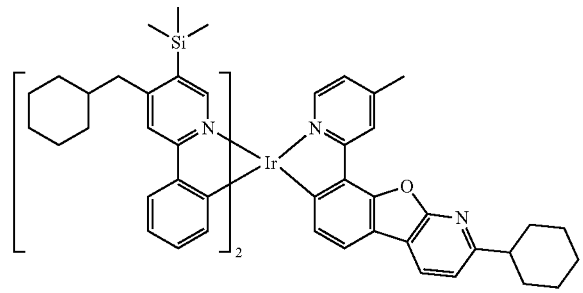
203
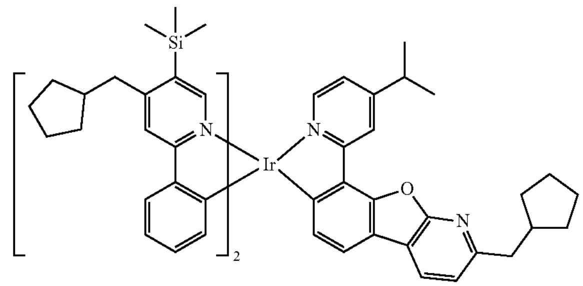
204
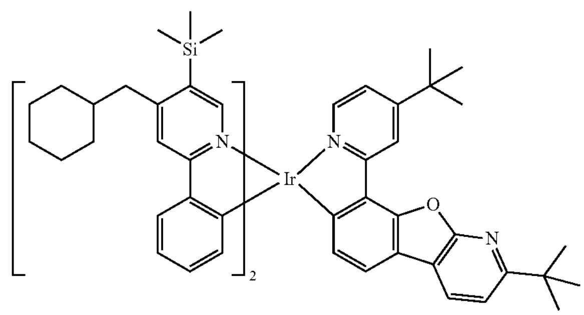
205
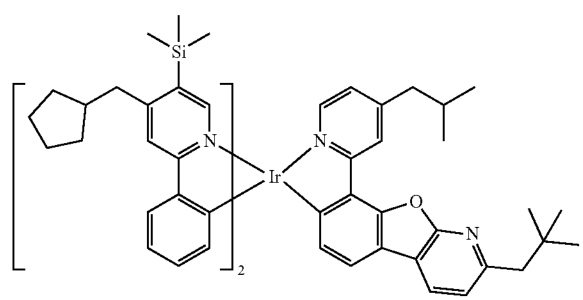
206
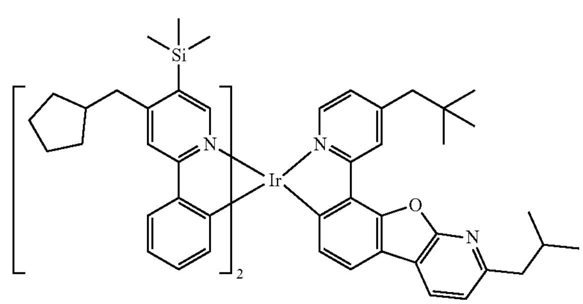

-continued
207
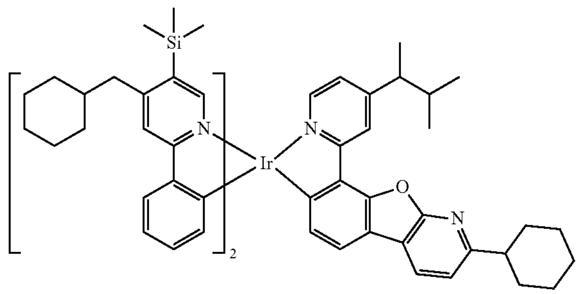
208
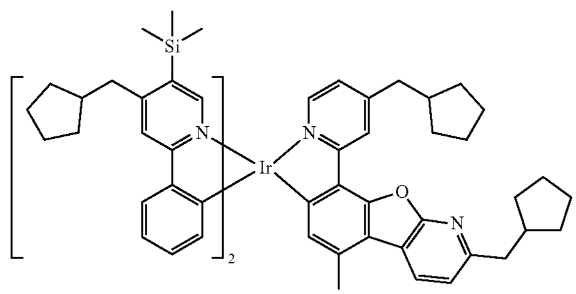
209
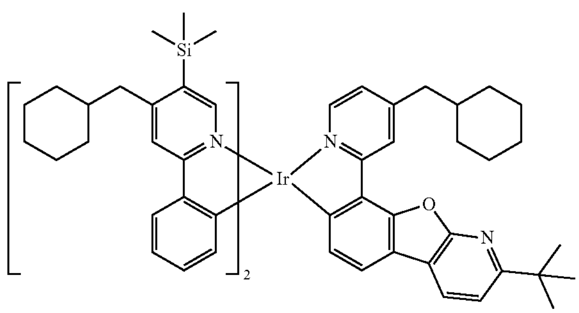
210
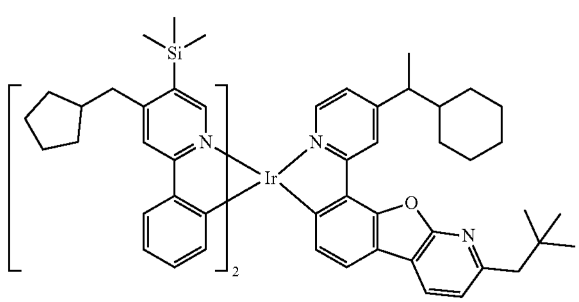
211
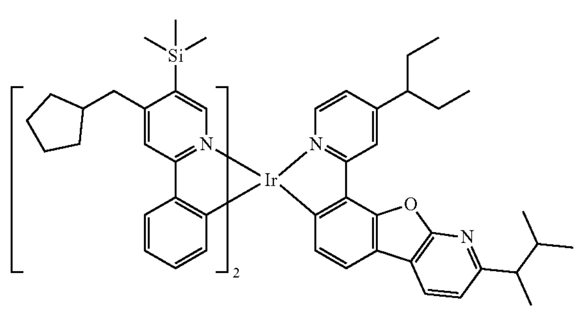
-continued
212
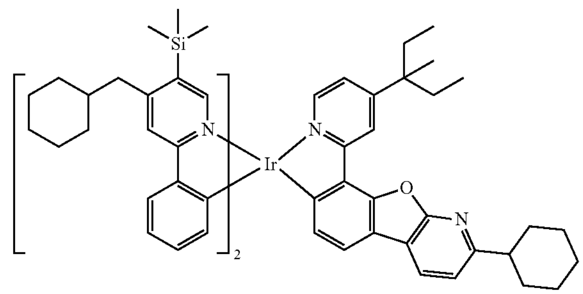
213
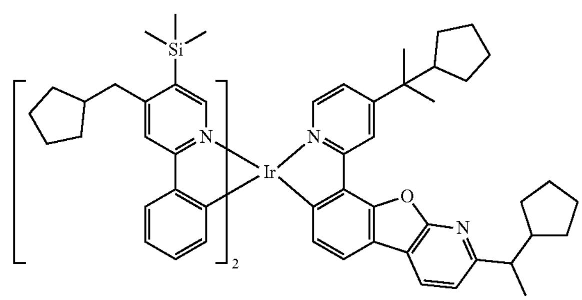
214
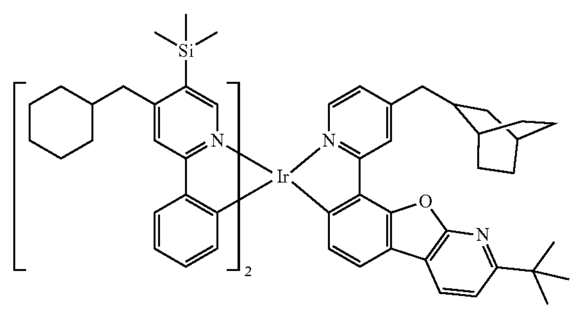
215
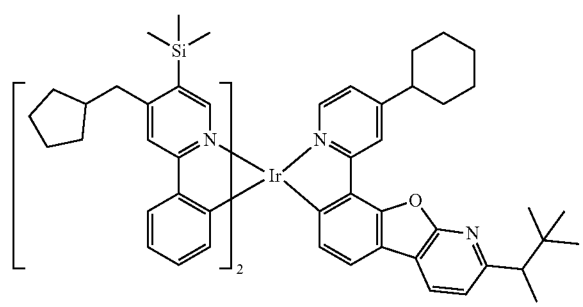
216
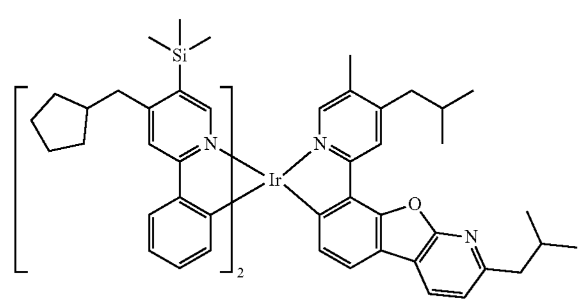

-continued
217
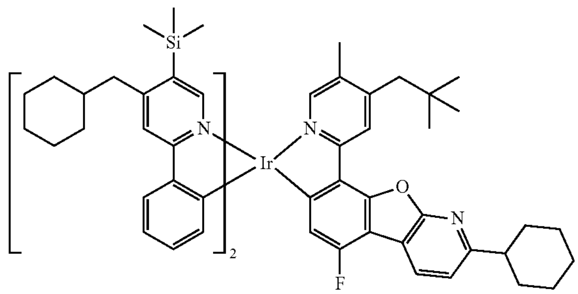
218
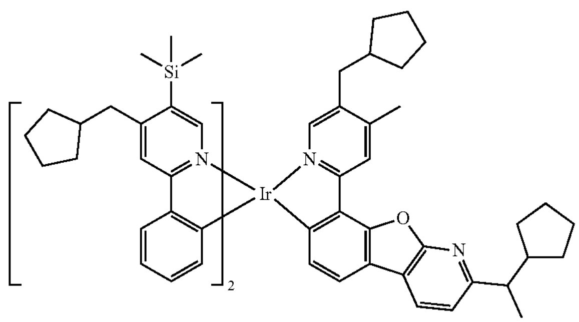
219
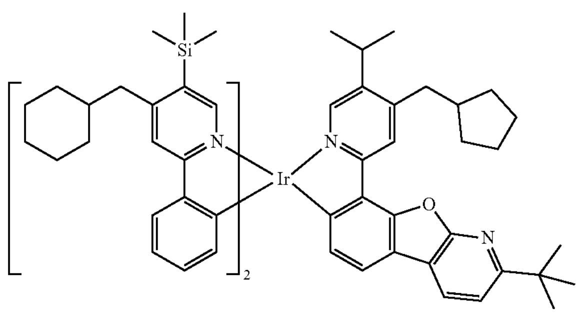
220
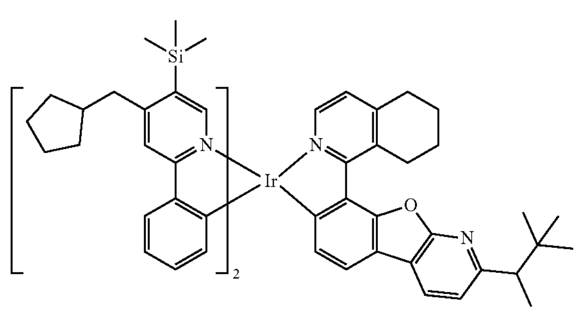
-continued
221
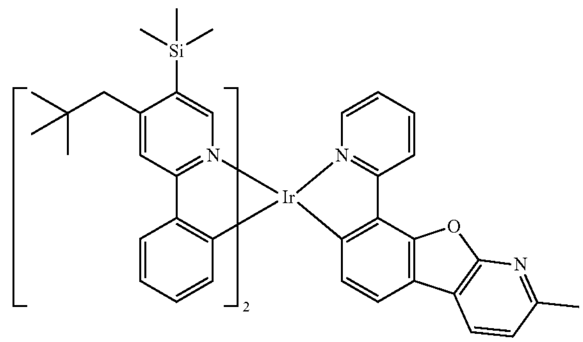
222
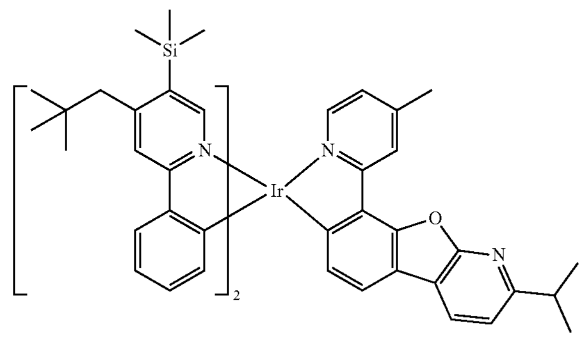
223
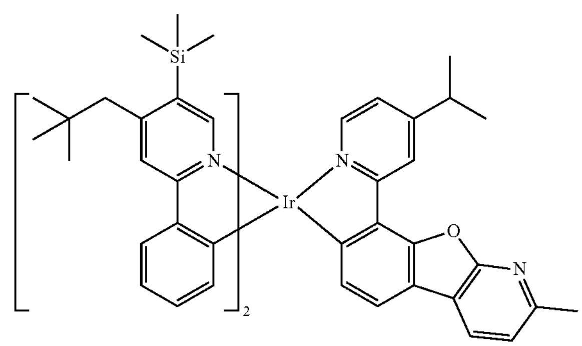
224
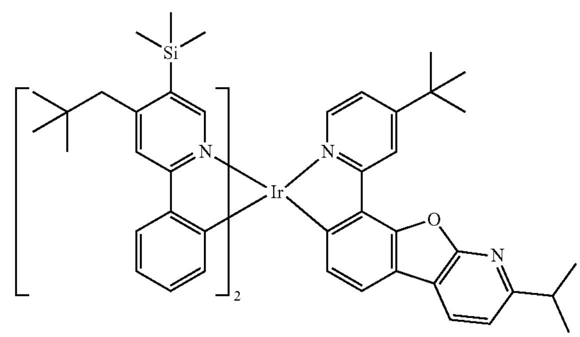

225
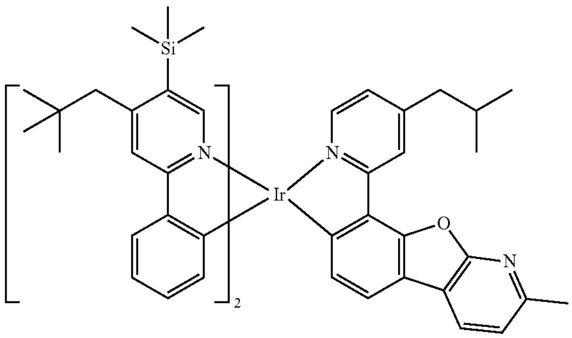
226
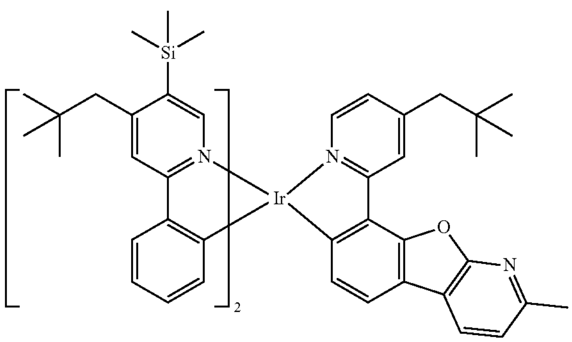
227
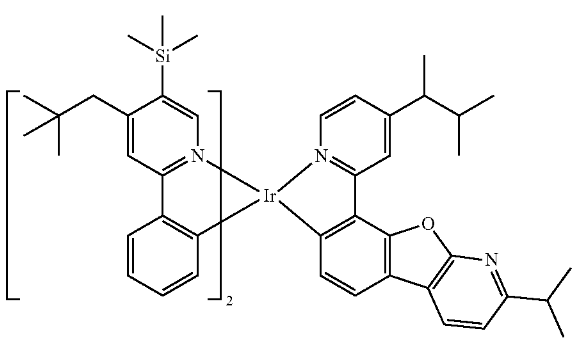
228
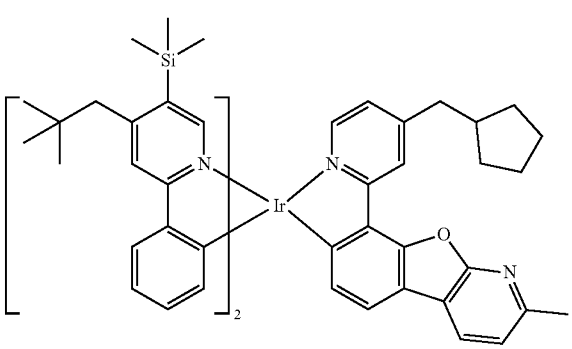
229
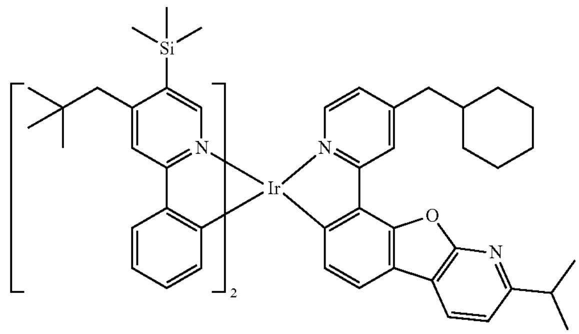
230
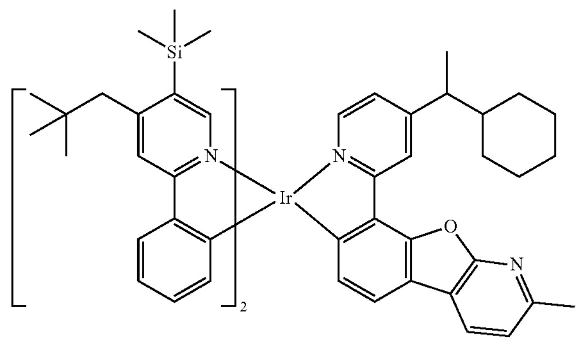
231
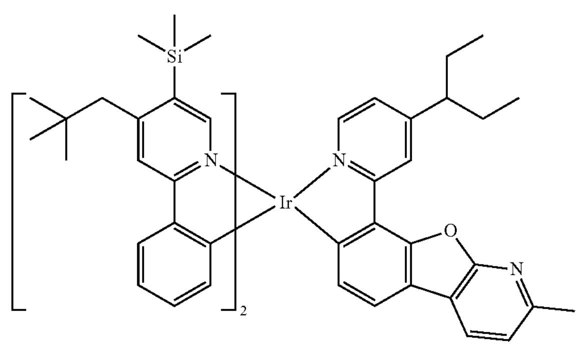
232
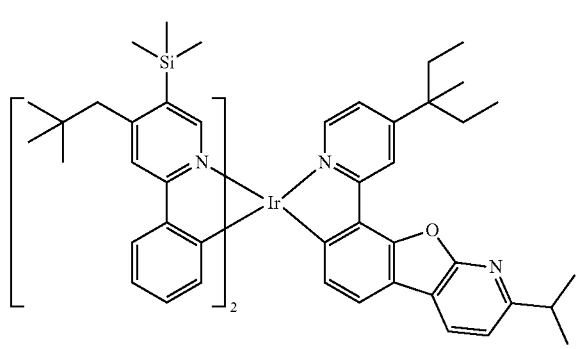

-continued
233
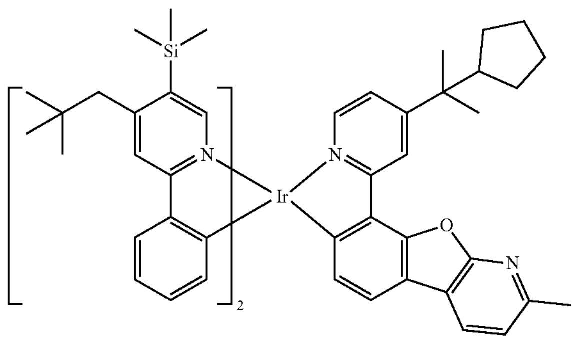
234
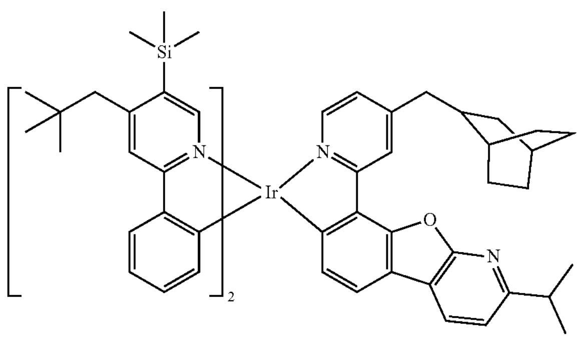
235
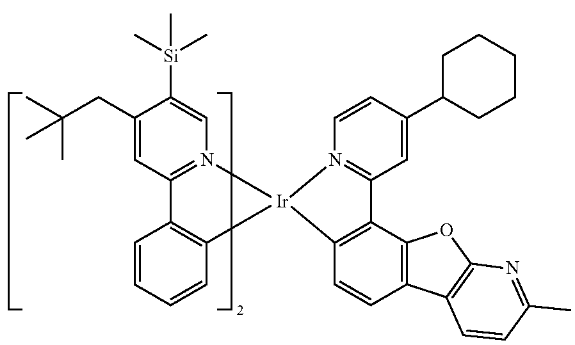
236
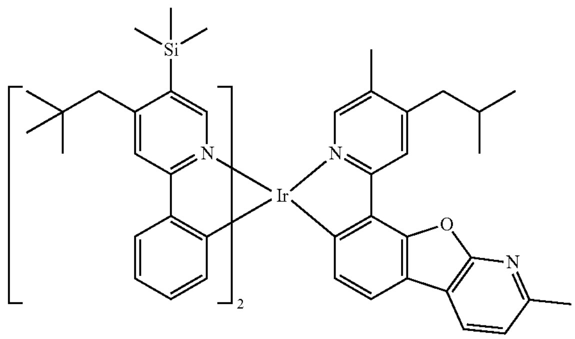
-continued
237
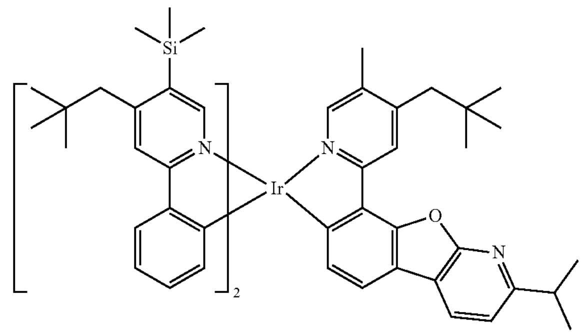
238
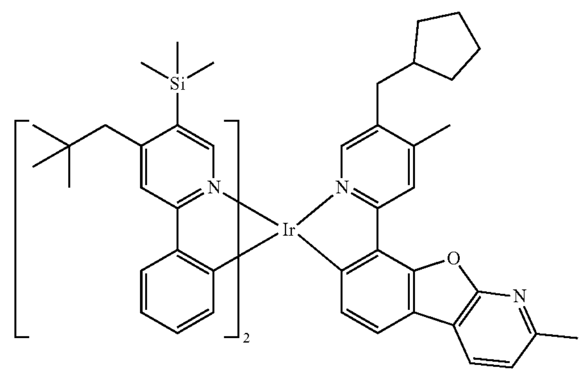
239
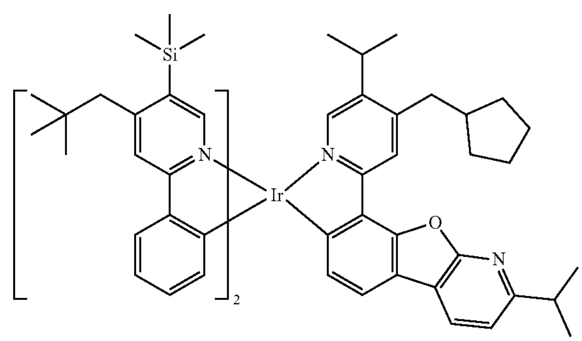
240
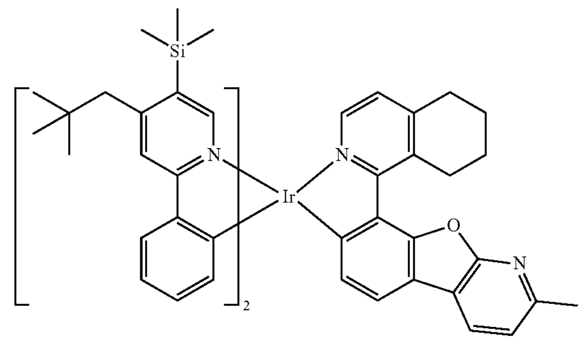

-continued
241
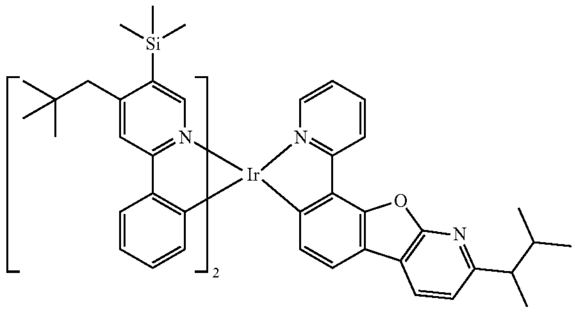
242
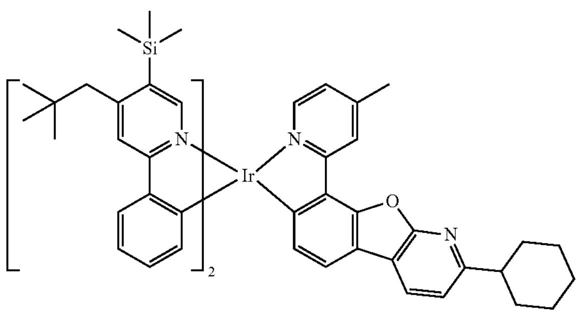
243
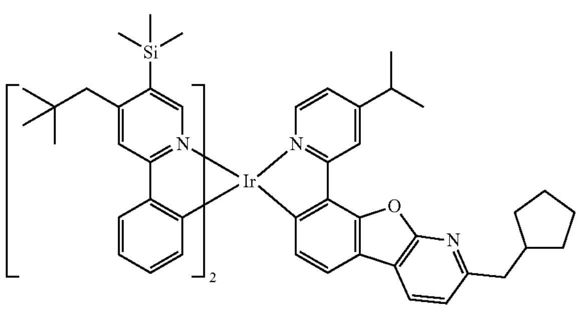
244
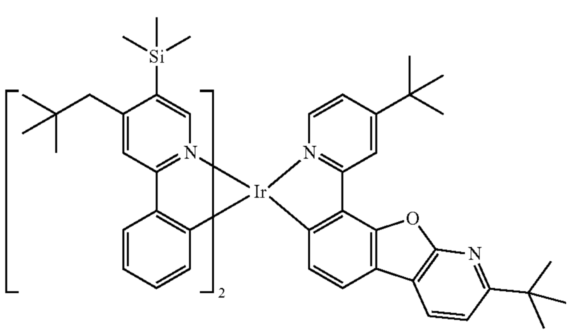
-continued
245
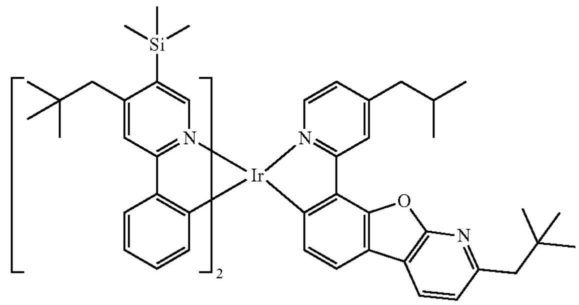
246
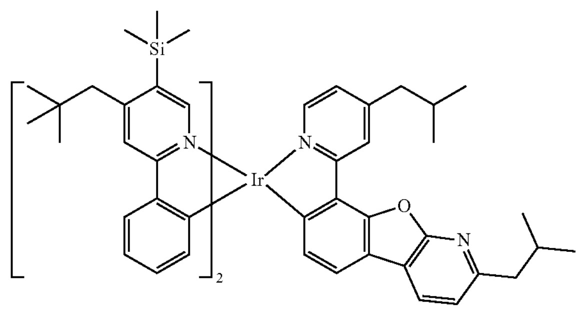
247
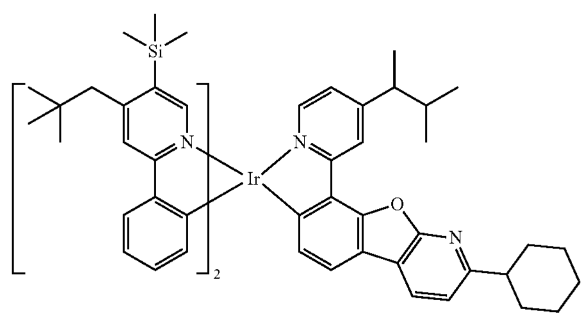
248
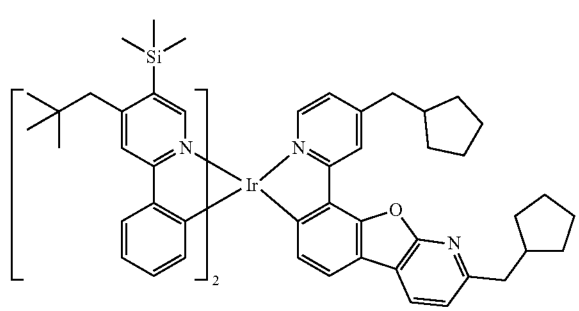

249
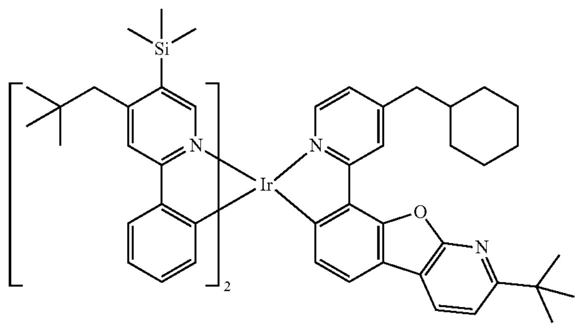
250
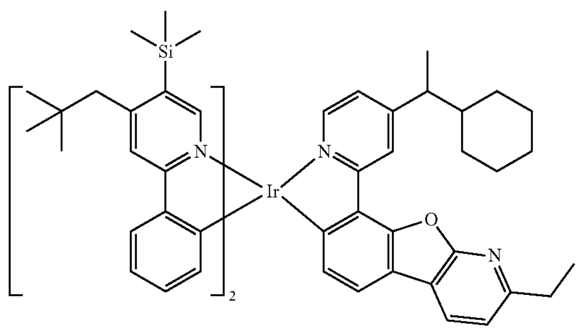
251
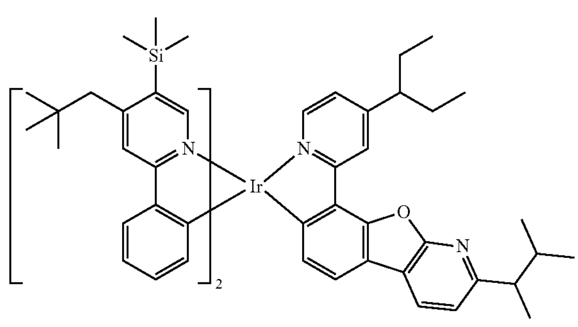
252
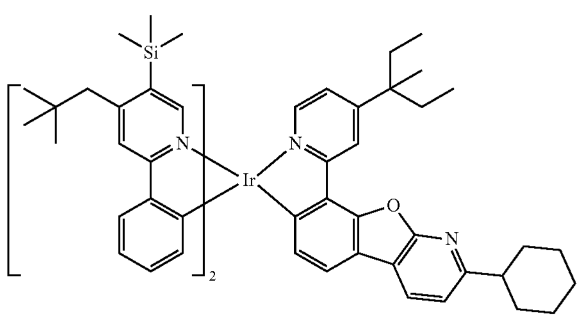
253
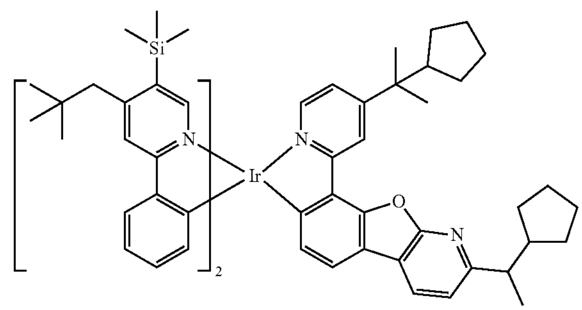
254
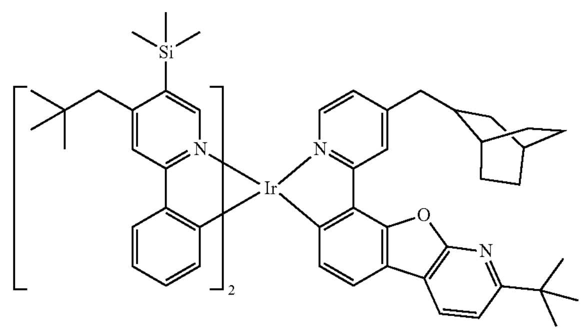
255
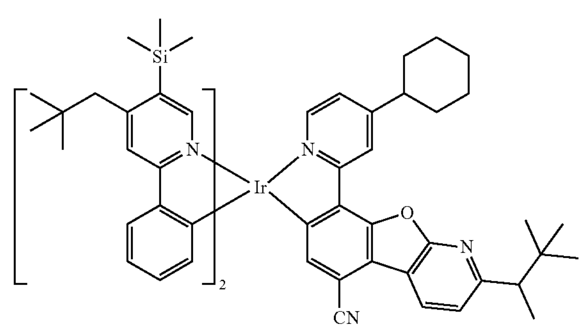
256
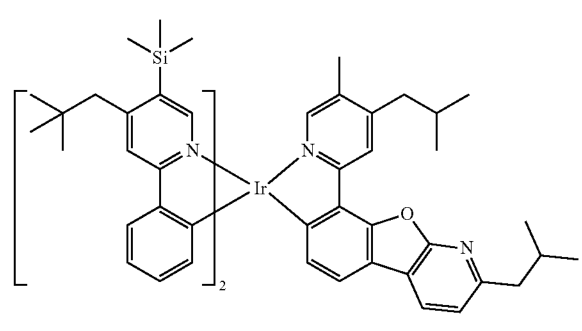

-continued
257
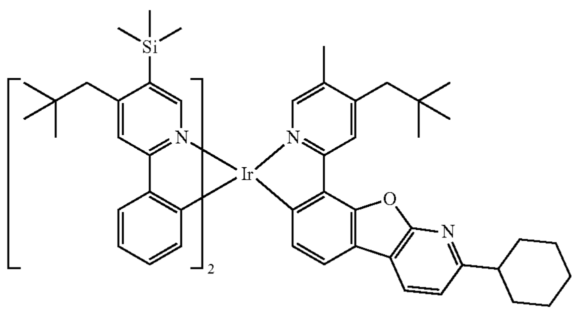
258
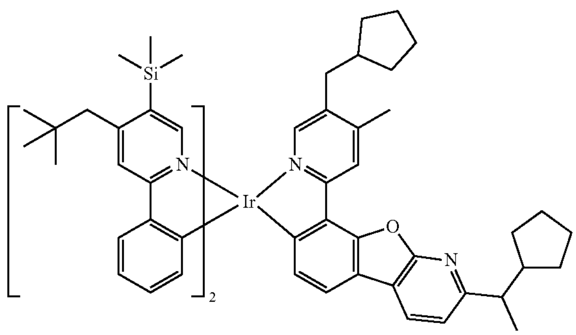
259
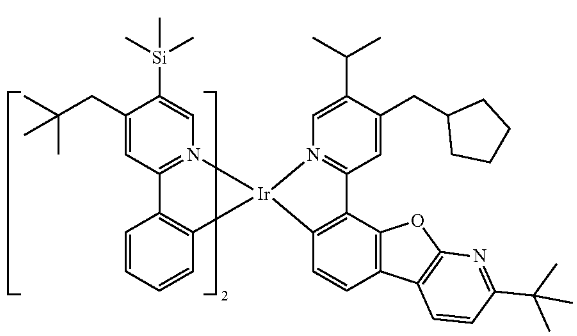
260
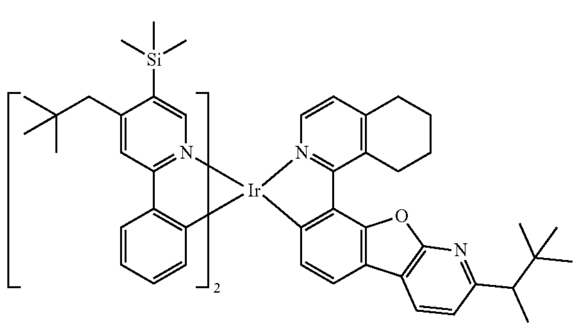
-continued
261
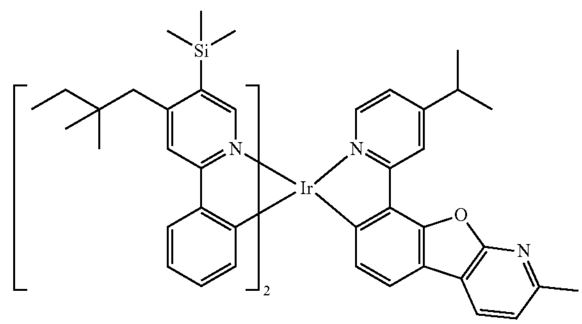
262
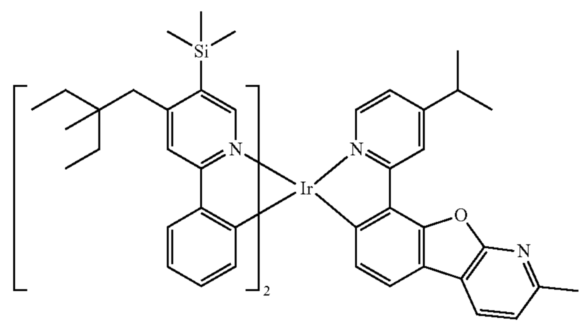
263
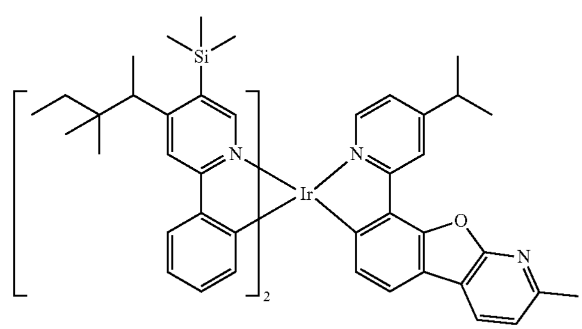
264
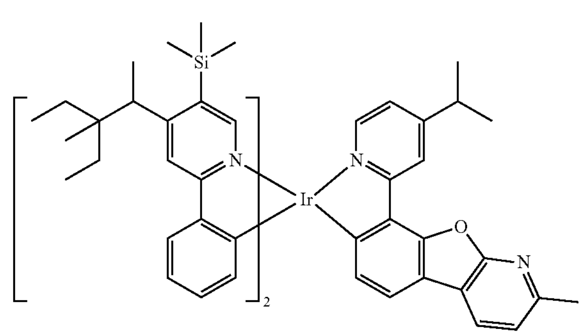

265
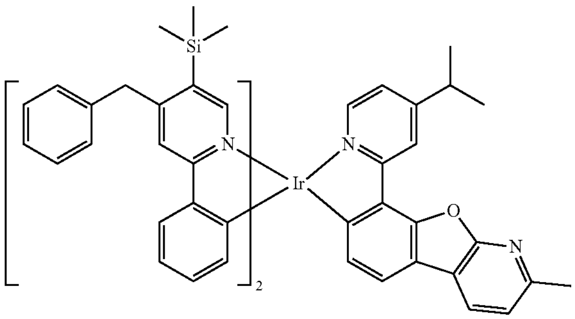
266
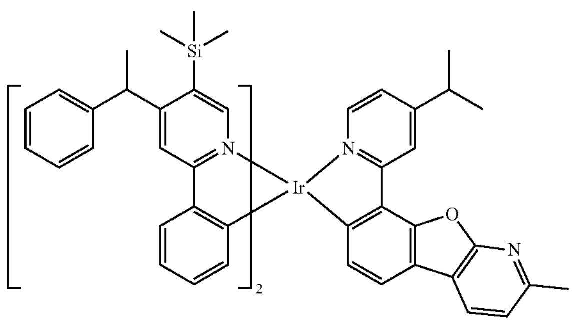
267
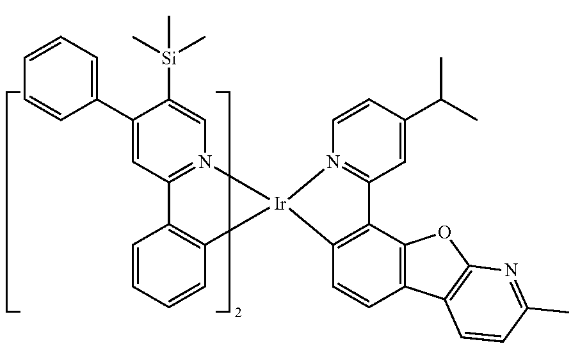
268
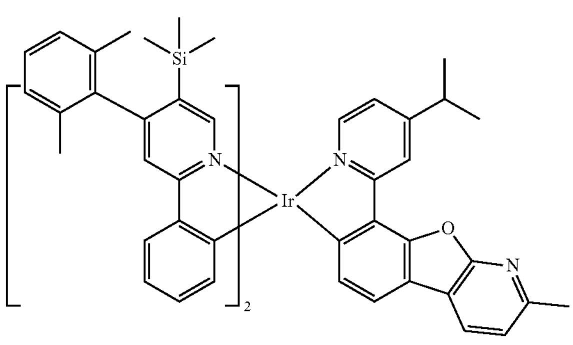
269
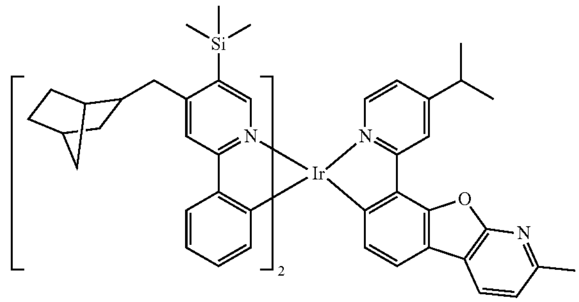
270
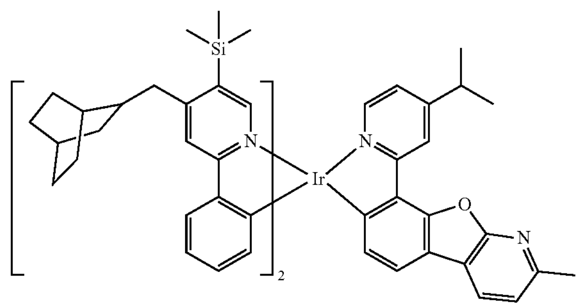
271
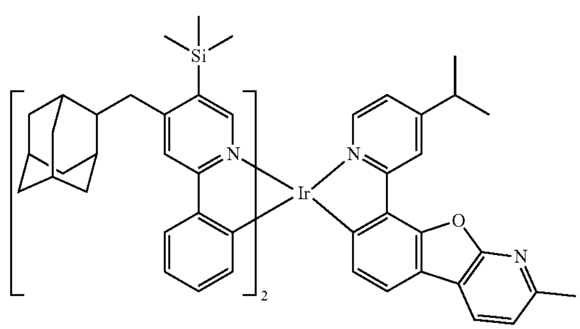
272
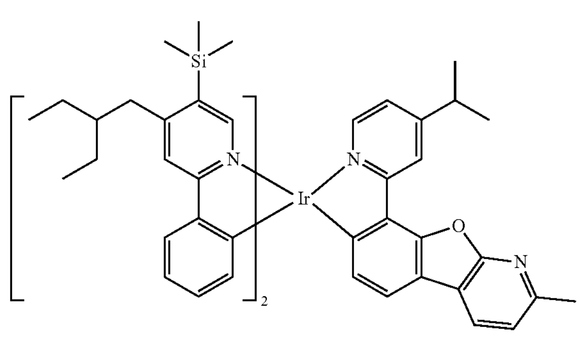

-continued
273
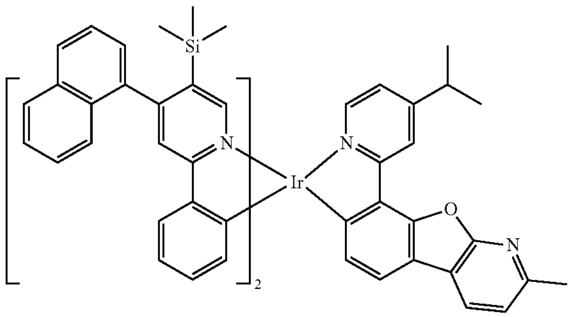
274
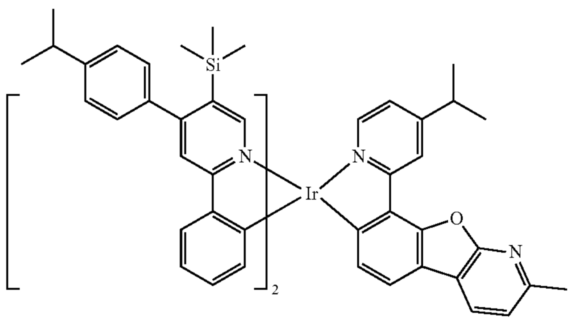
275
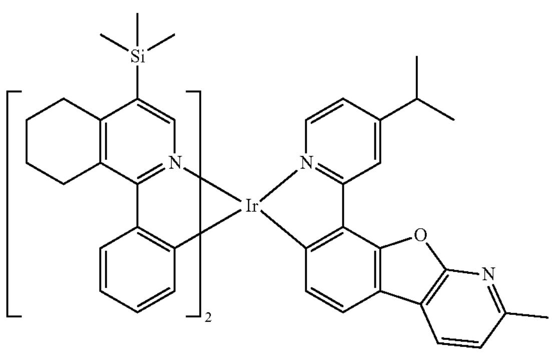
276
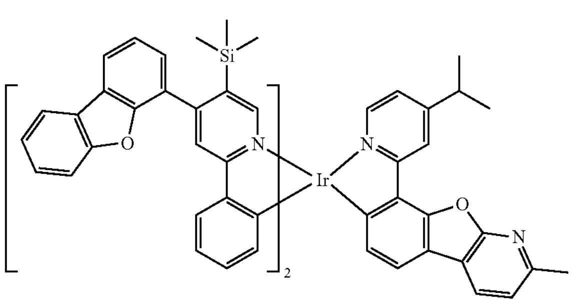
-continued
277
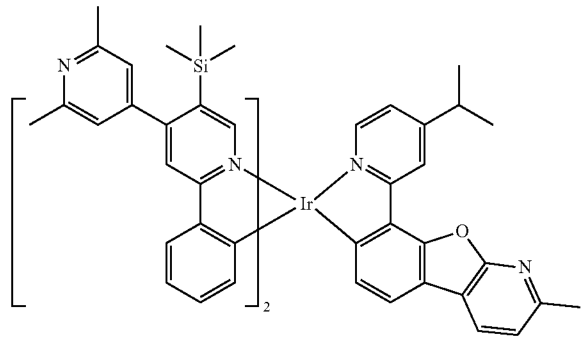
278
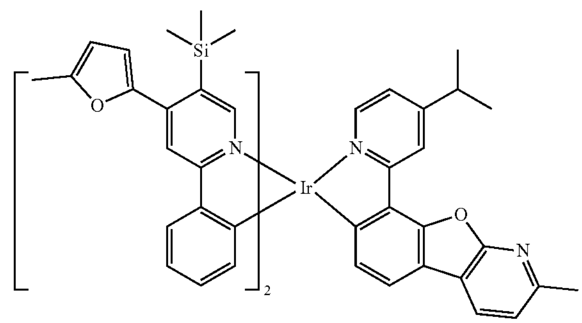
279
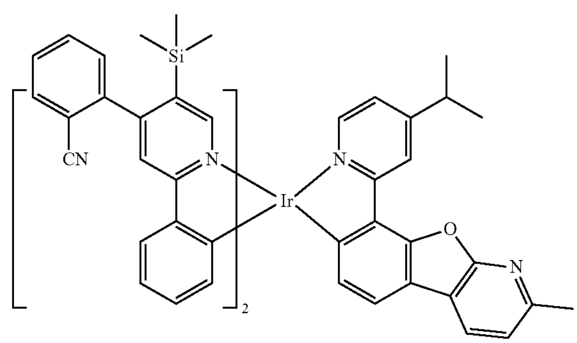
280
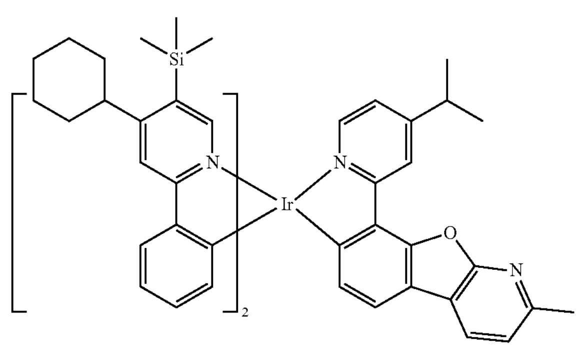

-continued
281
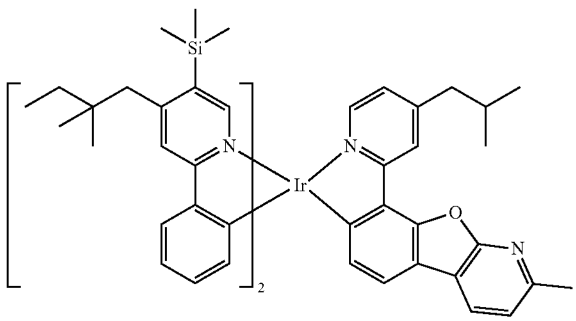
282
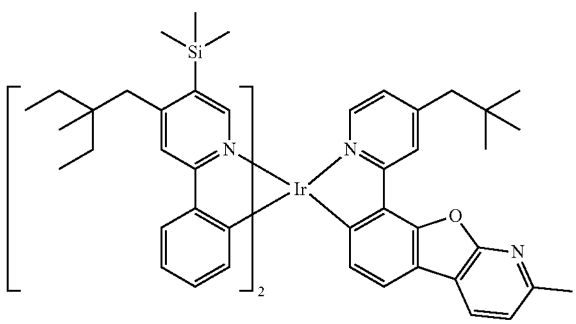
283
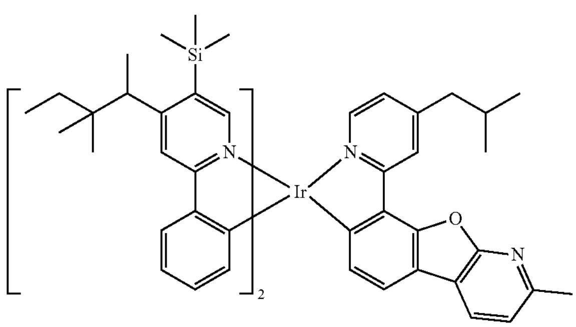
284
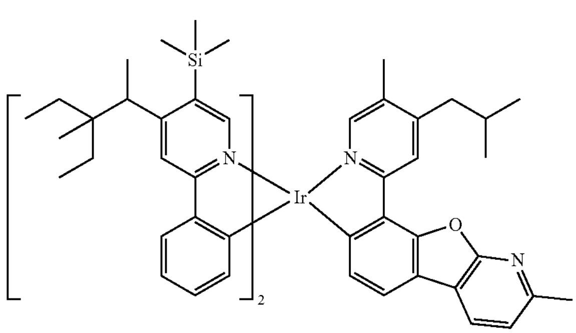
-continued
285
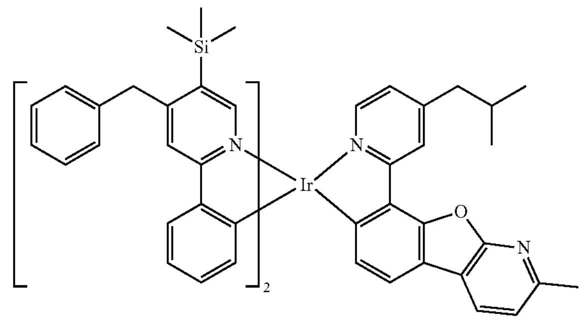
286
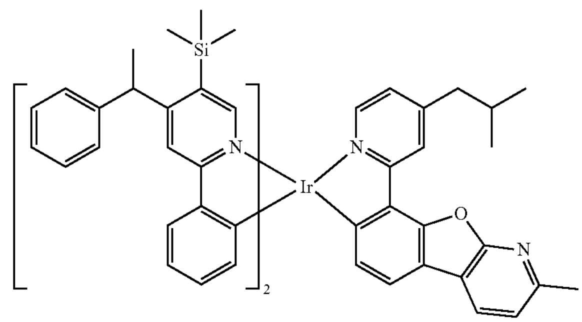
287
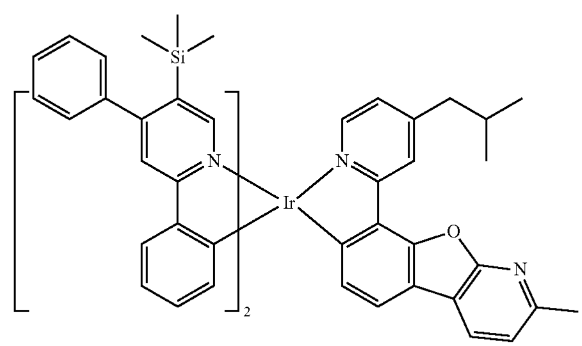
288
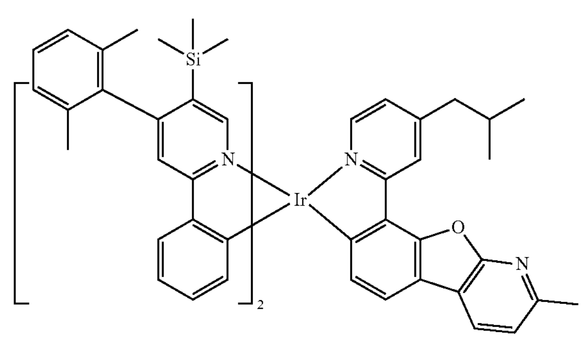

-continued
289
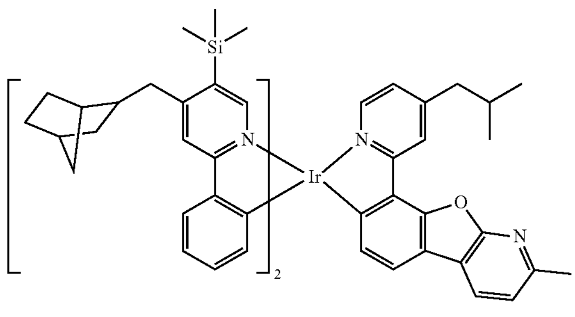
290
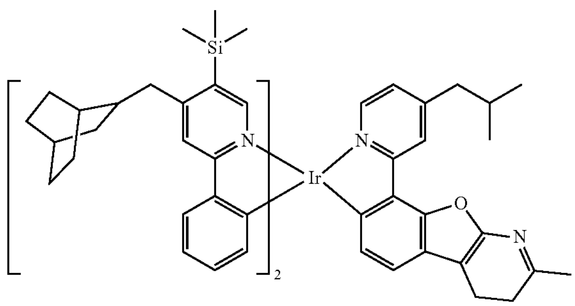
291
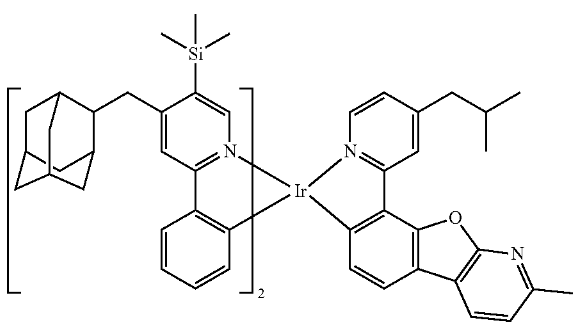
292
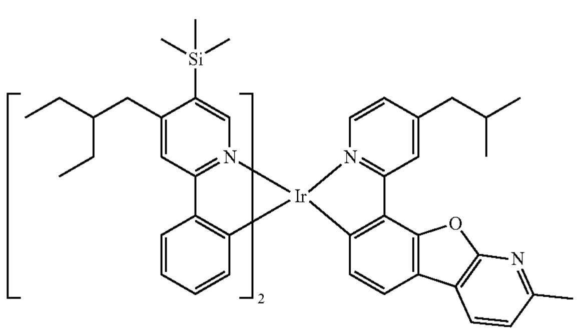
-continued
293
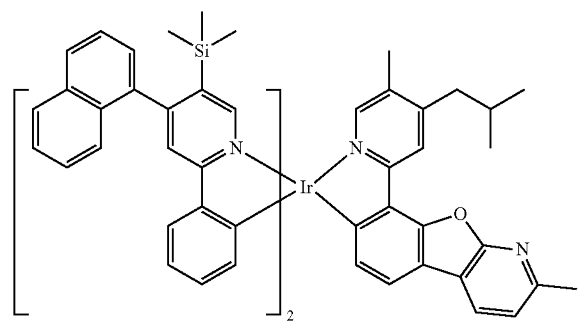
294
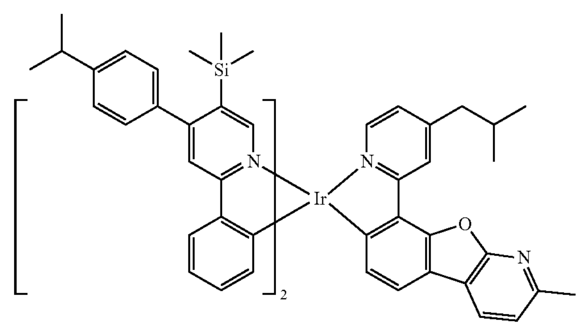
295
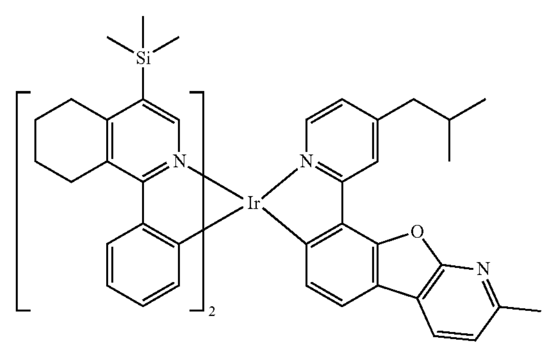
296
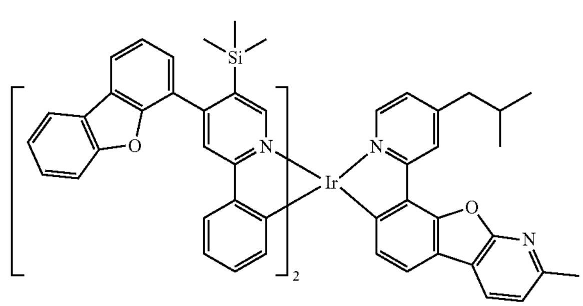

-continued
297
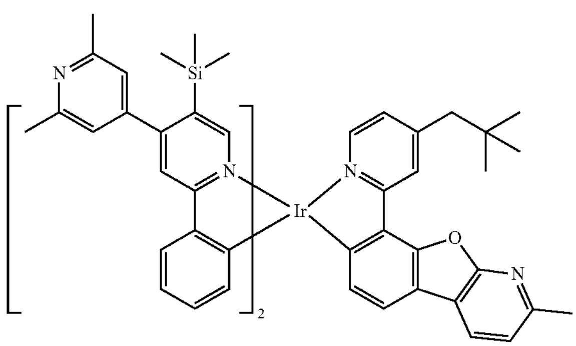
298
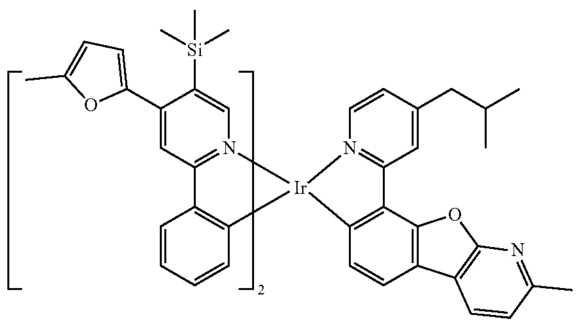
299
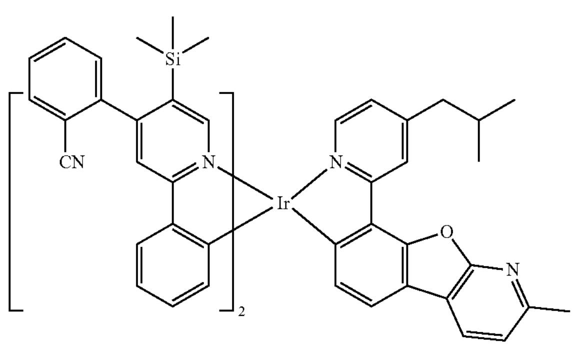
300
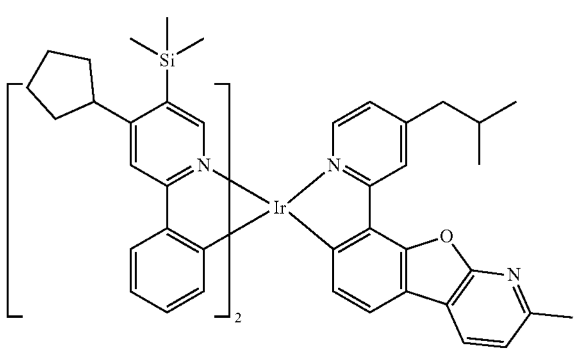
-continued
301
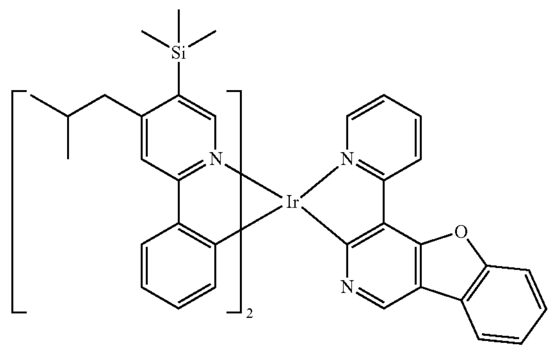
302
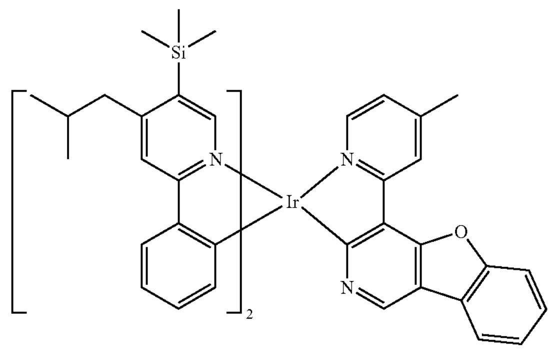
303
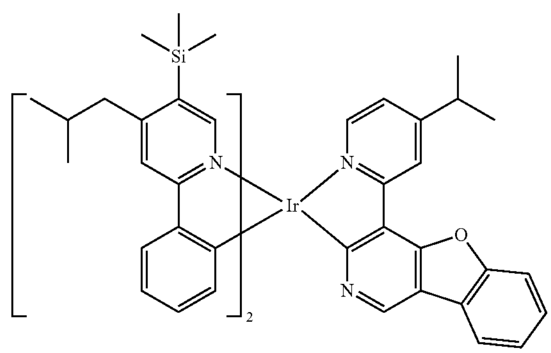
304
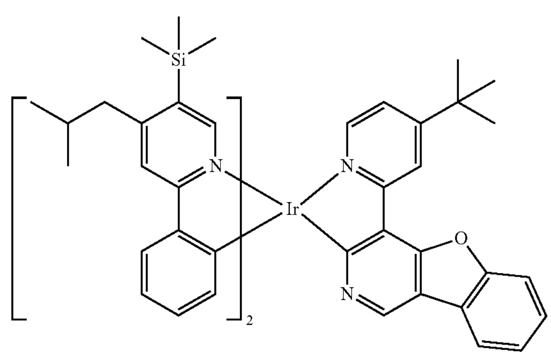

-continued
305
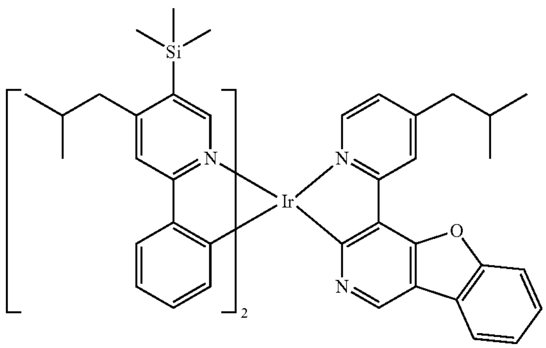
306
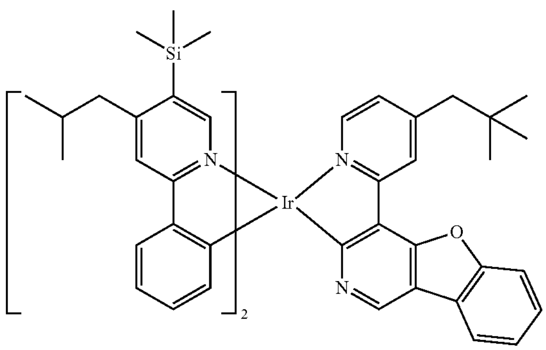
307
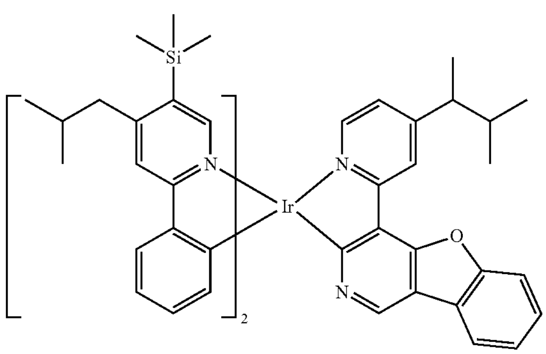
308
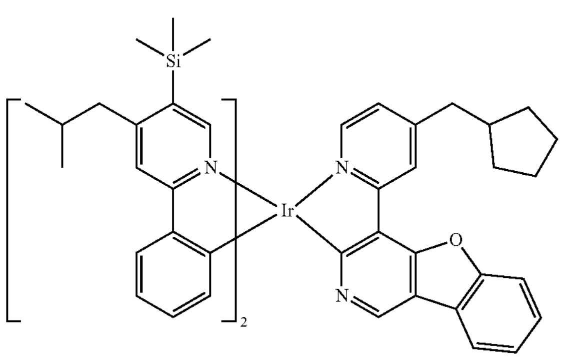
-continued
309
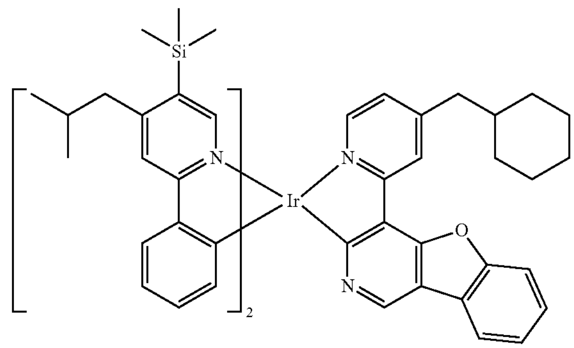
310
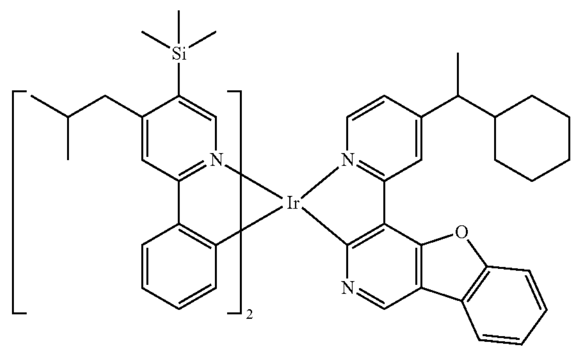
311
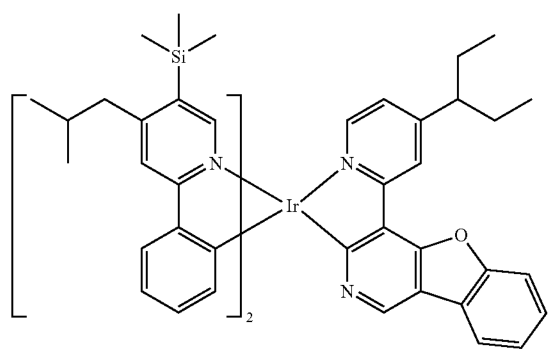
312
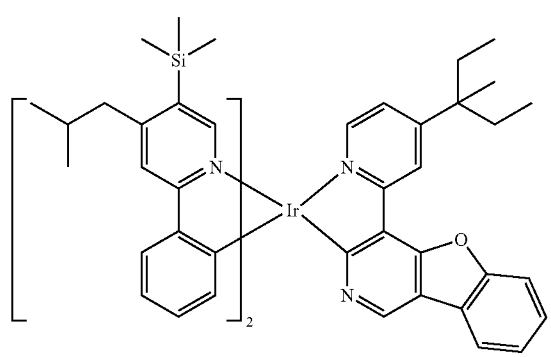

-continued
313
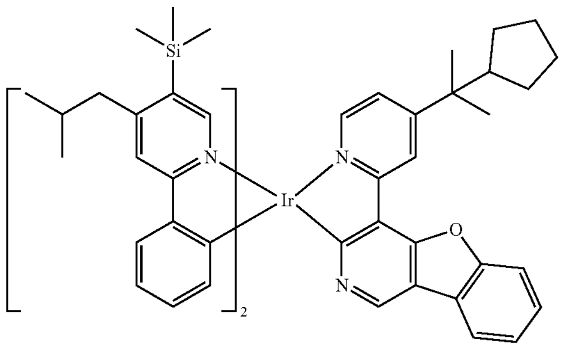
314
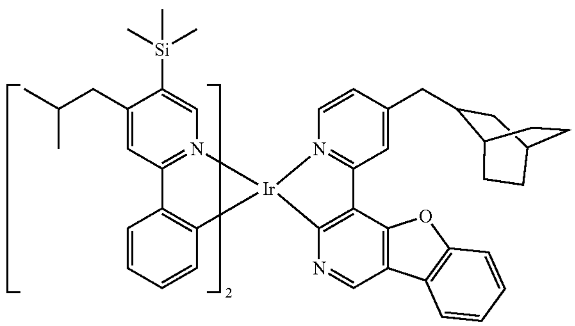
315
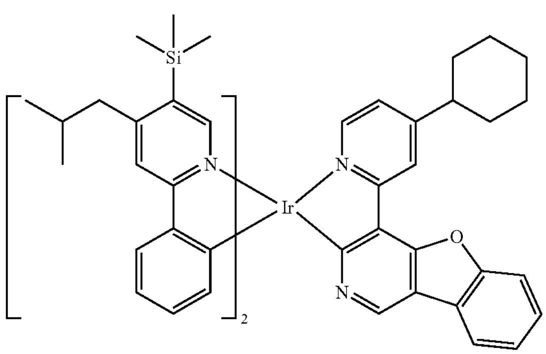
316
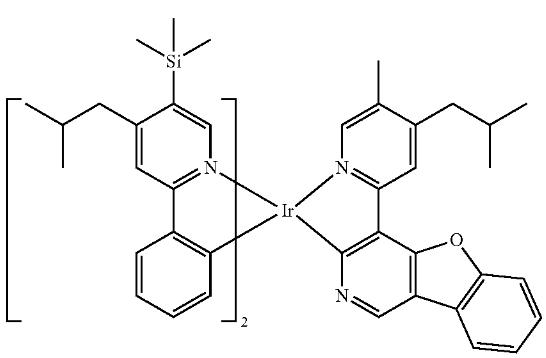
-continued
317
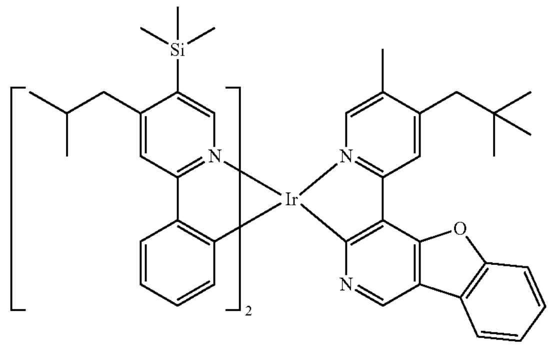
318
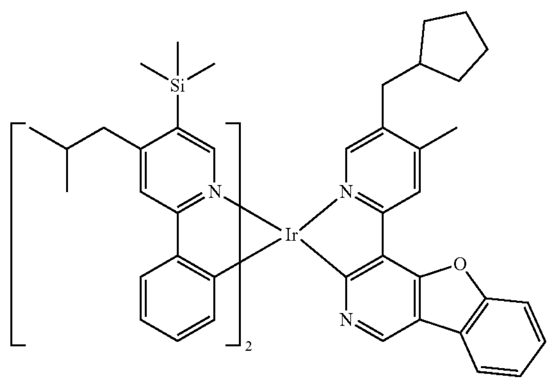
319
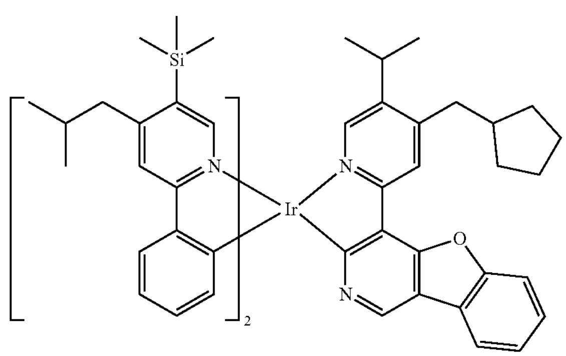
320
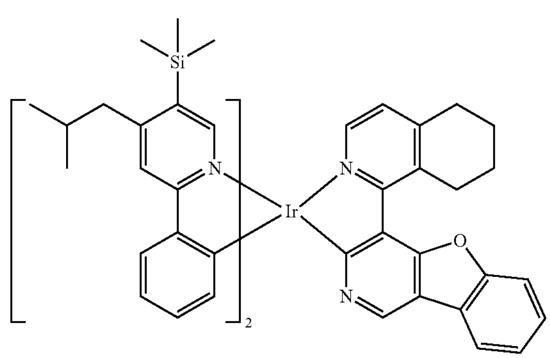

-continued
321
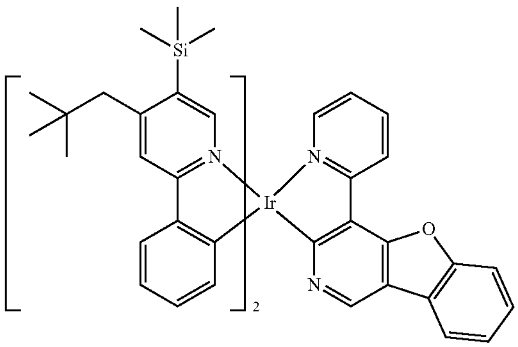
325
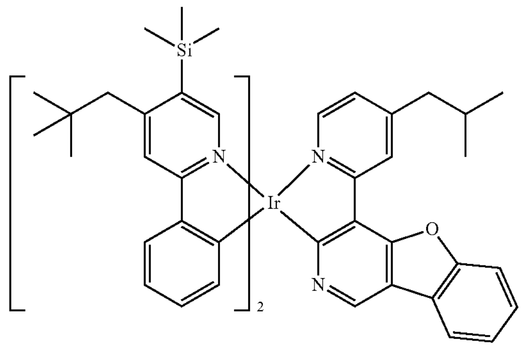
322
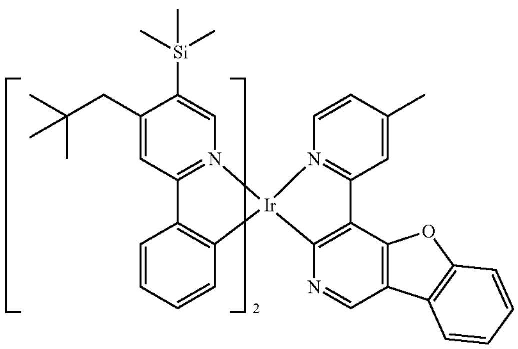
326
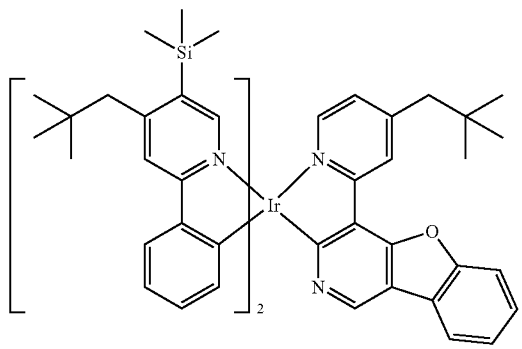
323
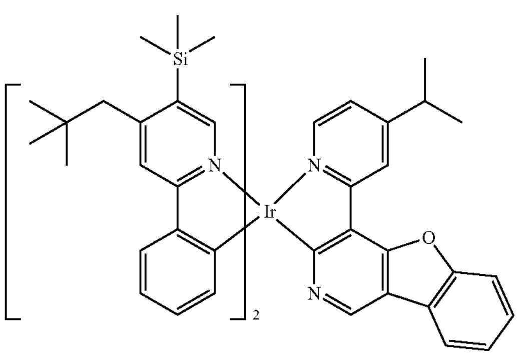
327
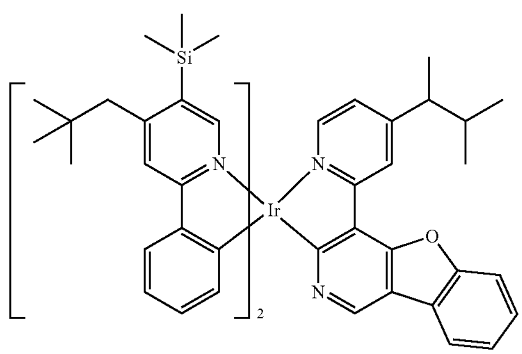
324
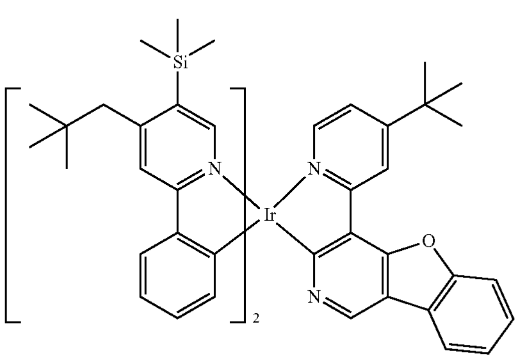
328
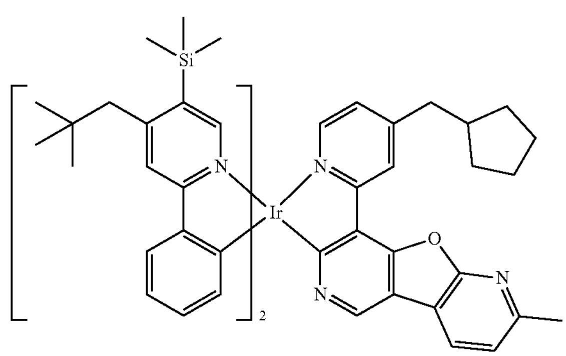

-continued
329
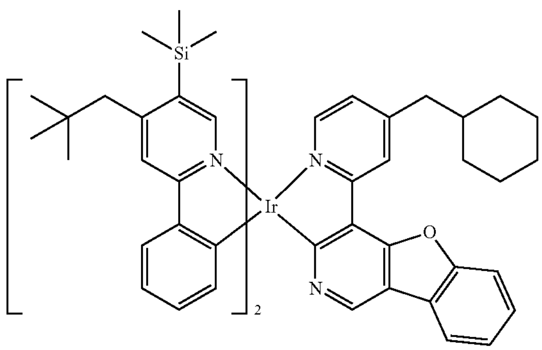
330
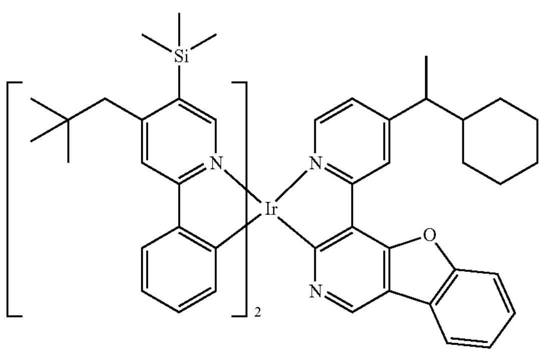
331
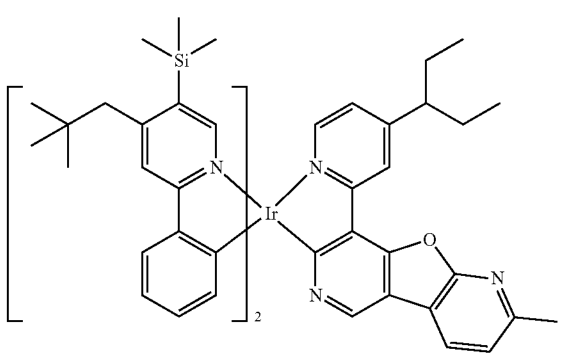
332
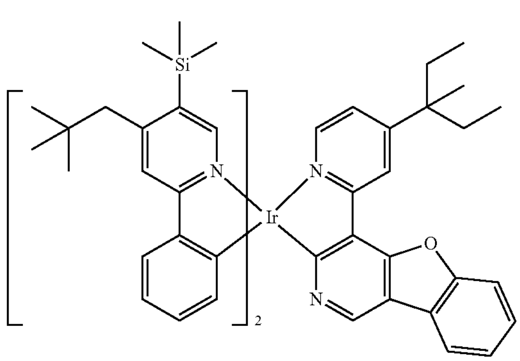
-continued
333
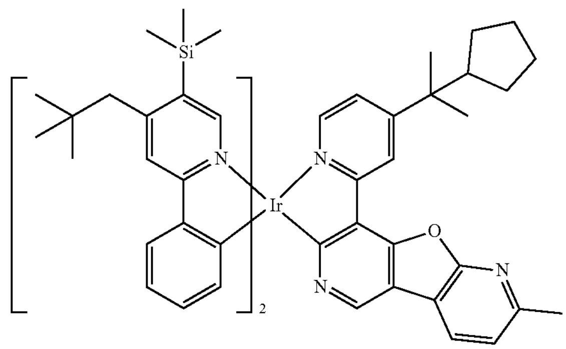
334
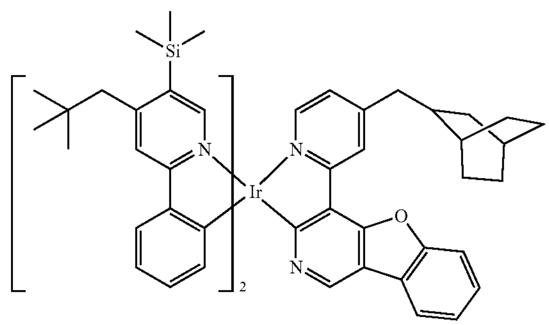
335
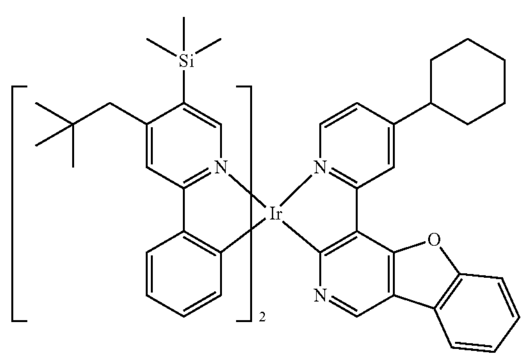
336
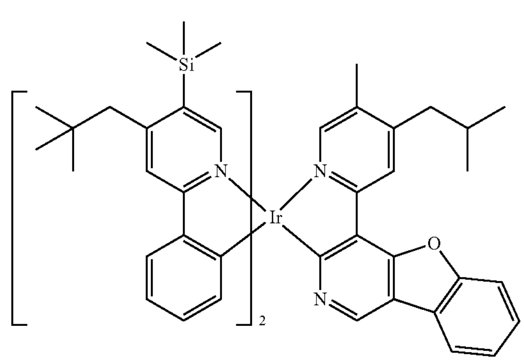

-continued
337
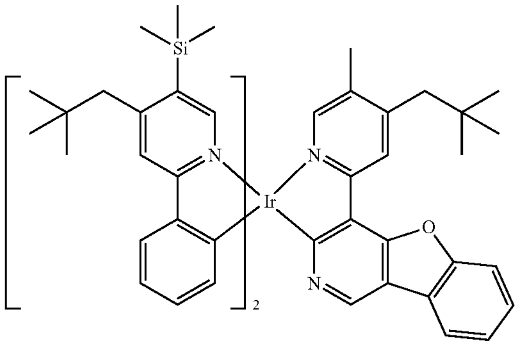
338
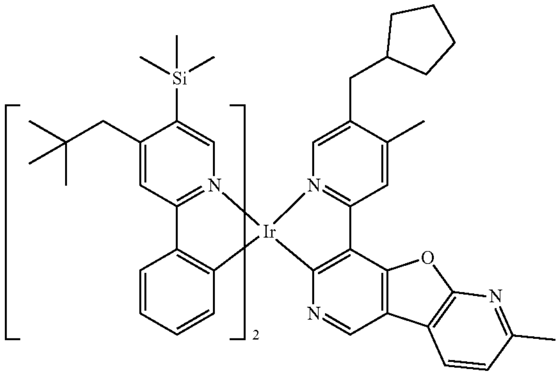
339
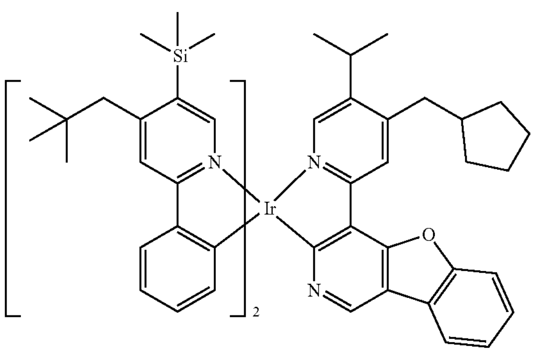
340
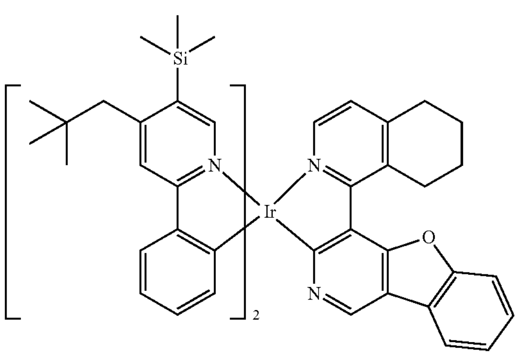
-continued
341
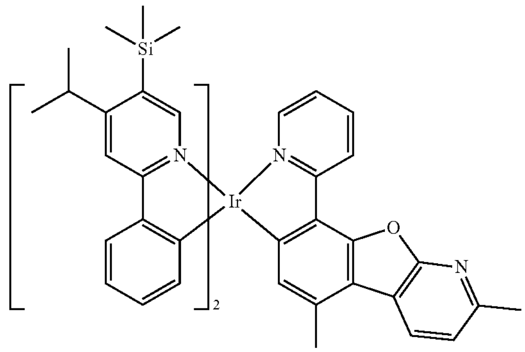
342
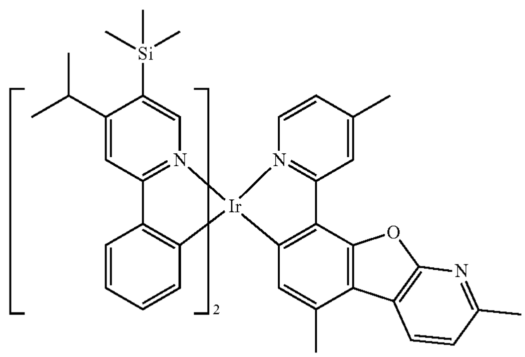
343
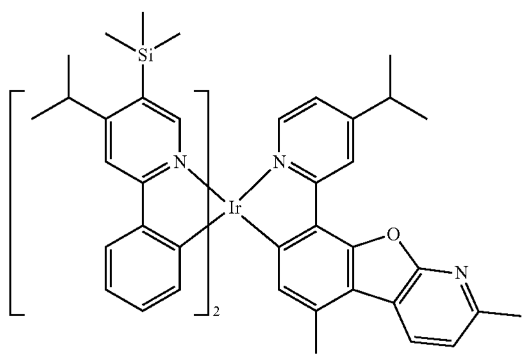
344
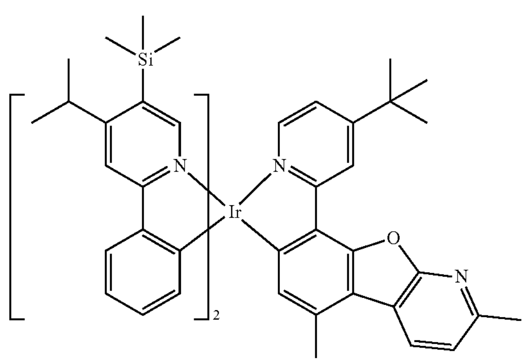

-continued
345
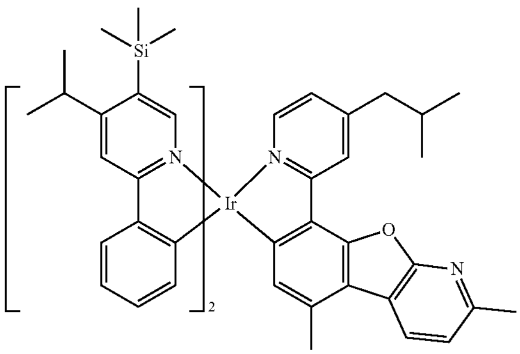
346
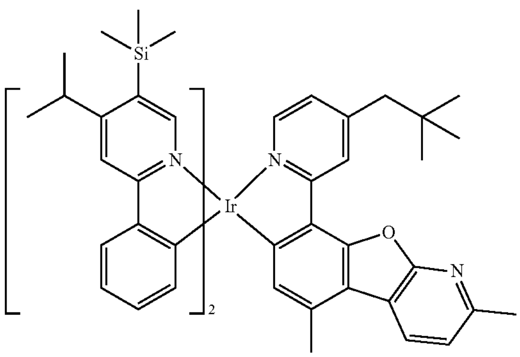
347
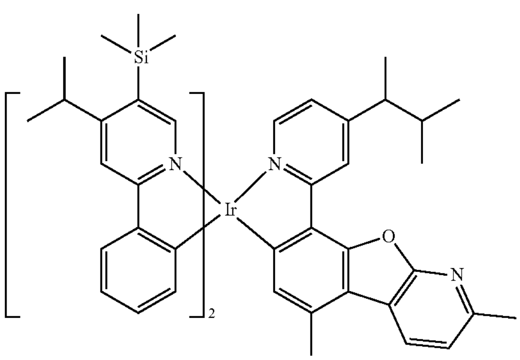
348
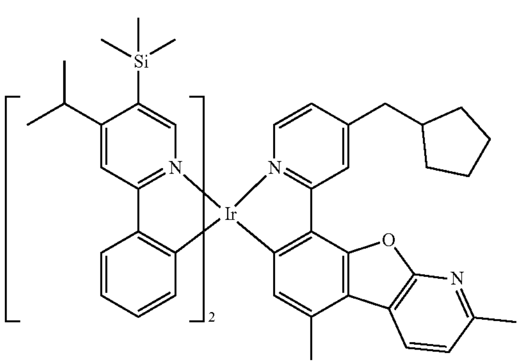
-continued
349
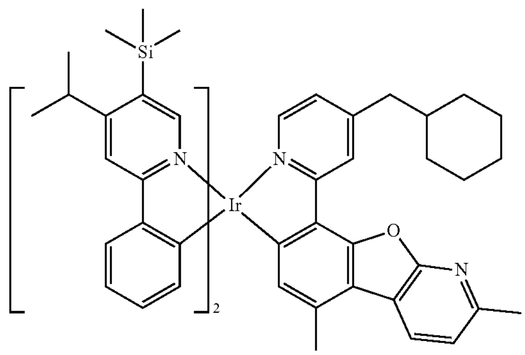
350
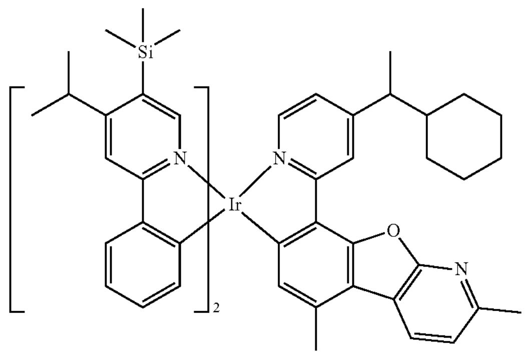
351
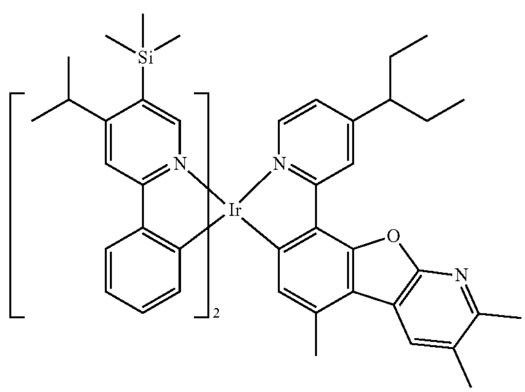
352
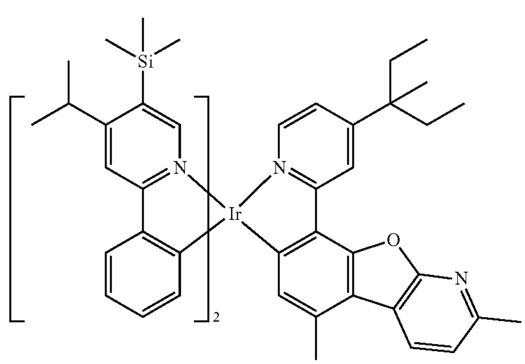

-continued
353
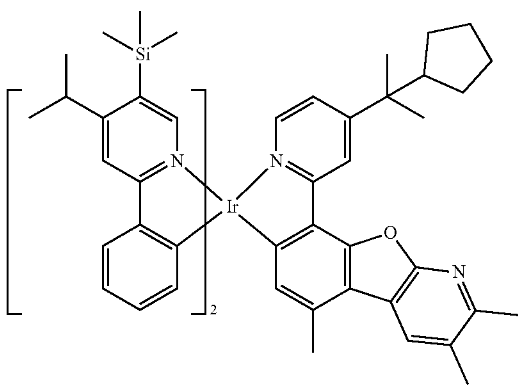
354
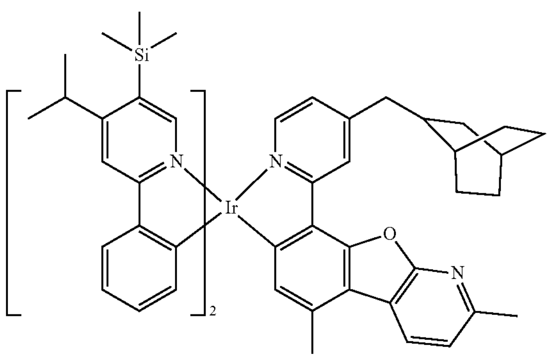
355
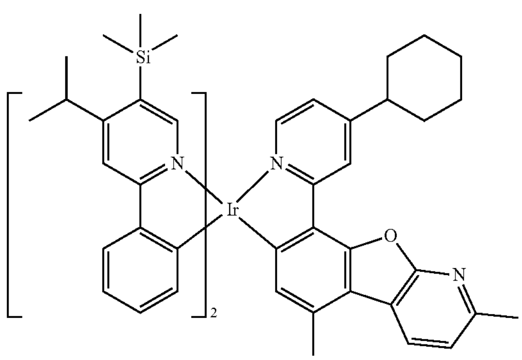
356
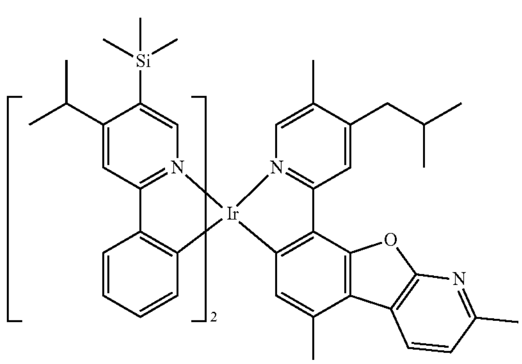
-continued
357
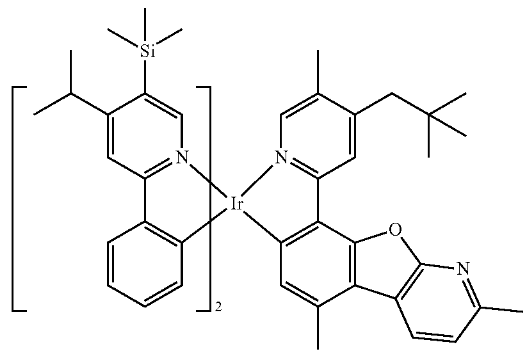
358
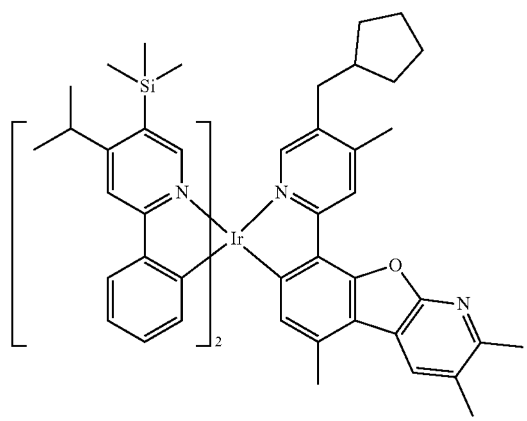
359
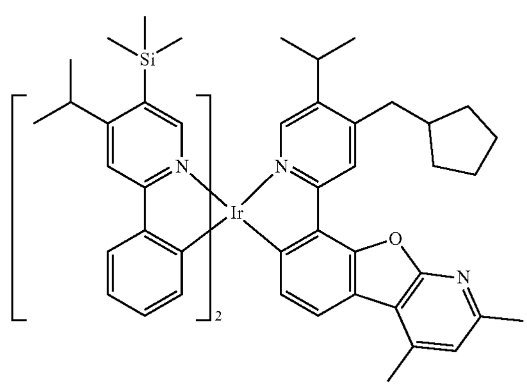
360
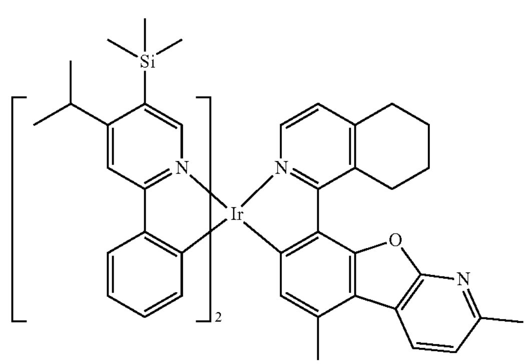

-continued
361
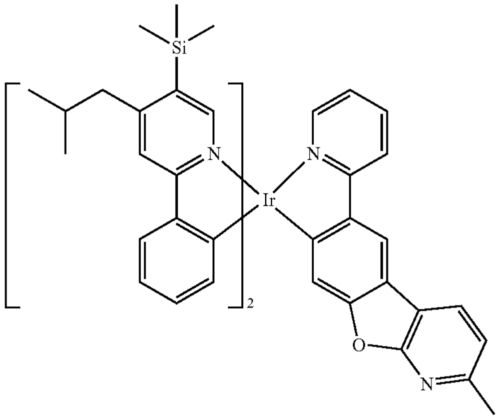
362
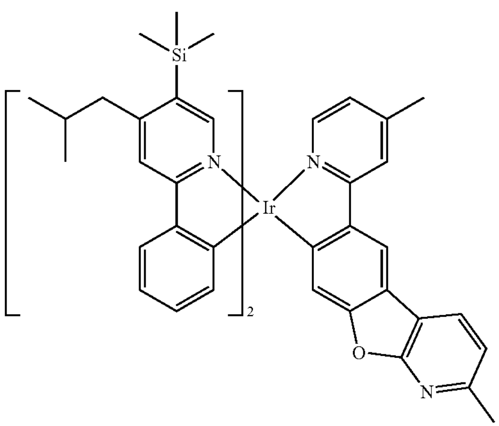
363
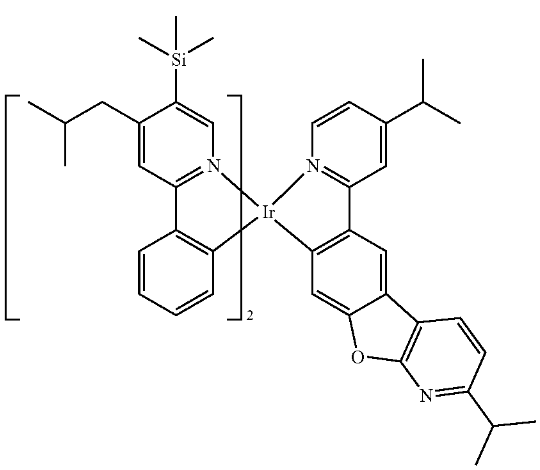
-continued
364
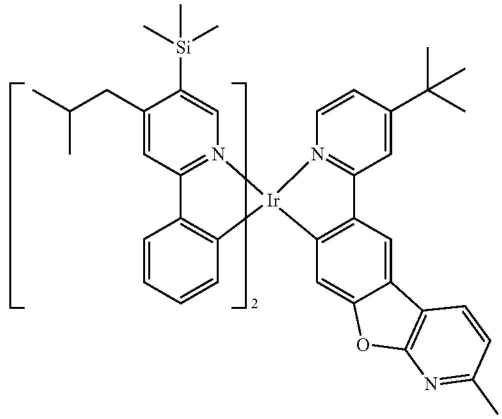
365
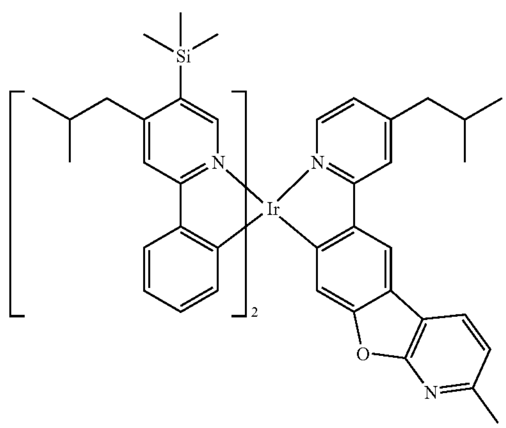
366
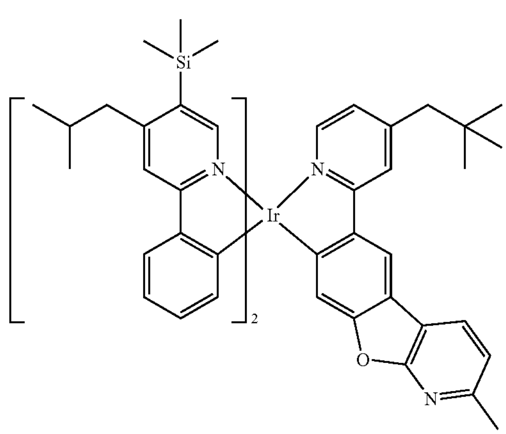

367
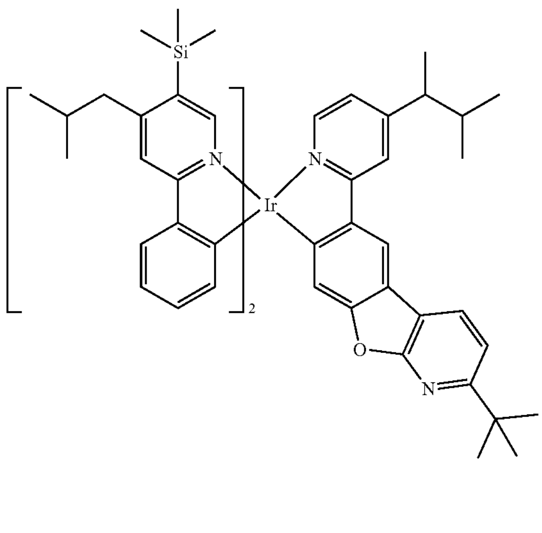
368
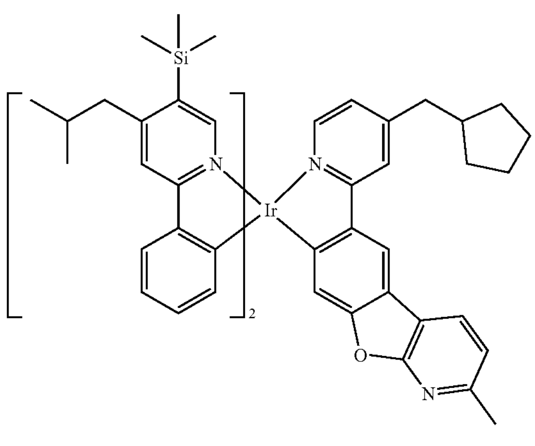
369
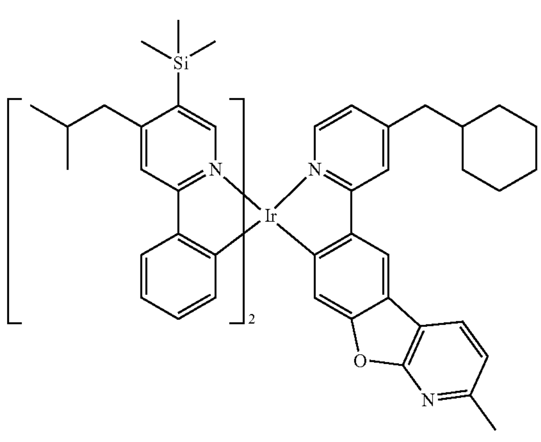
370
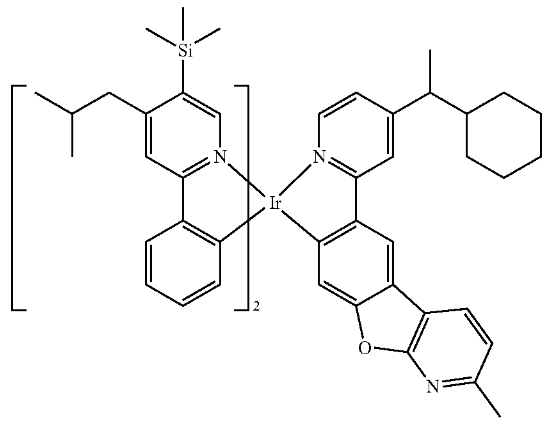
371
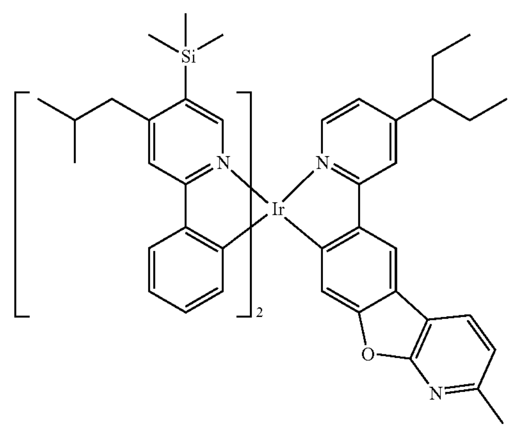
372
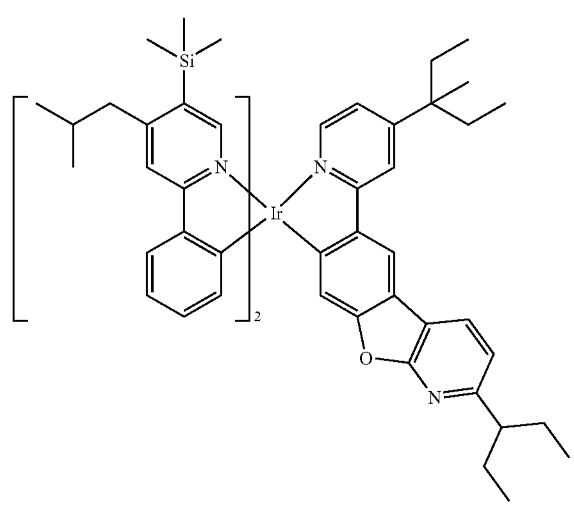

-continued
373
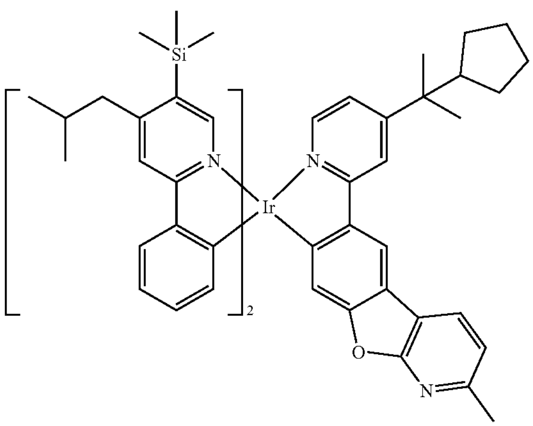
374
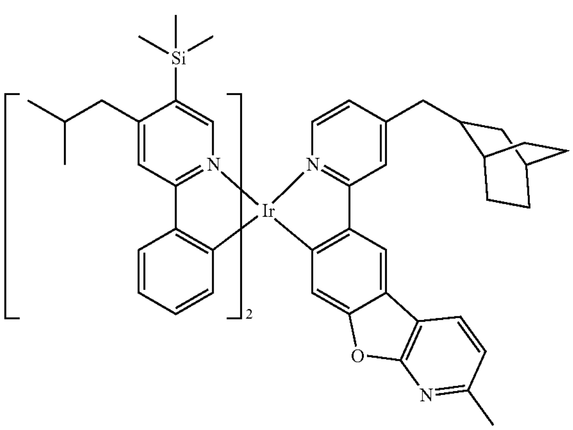
375
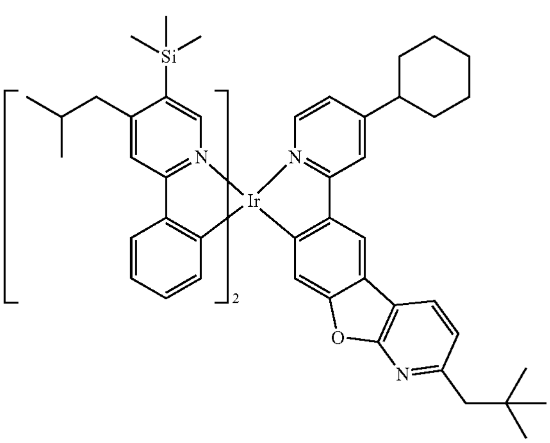
-continued
376
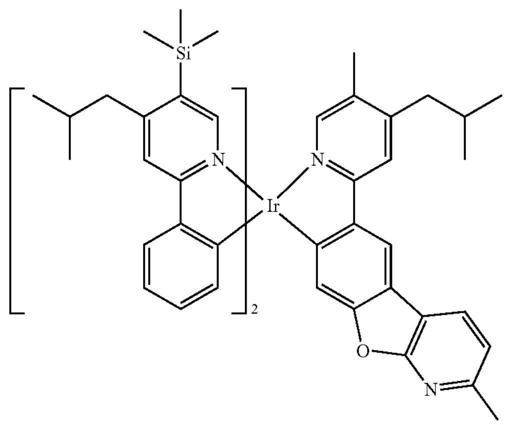
377
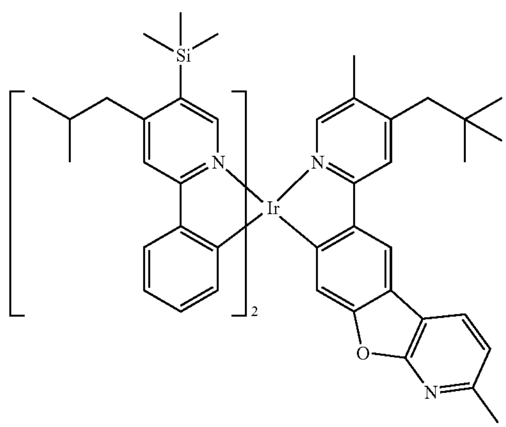
378
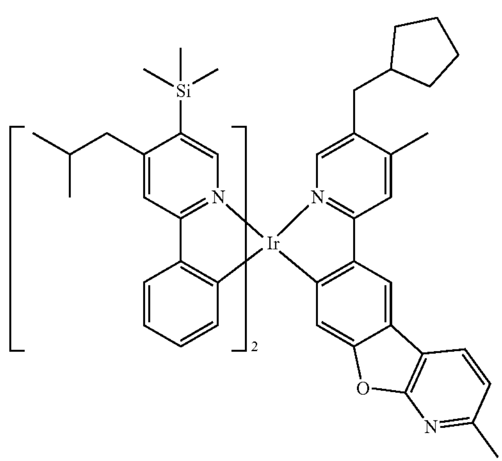

379
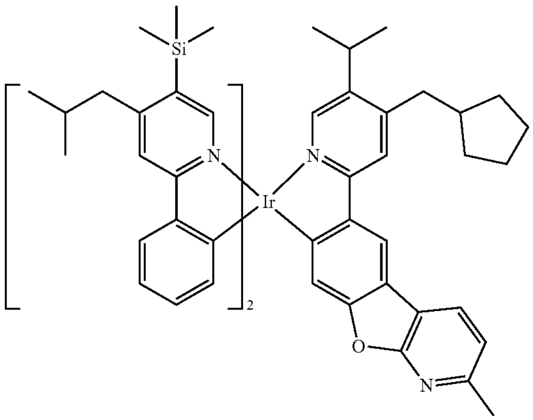
380
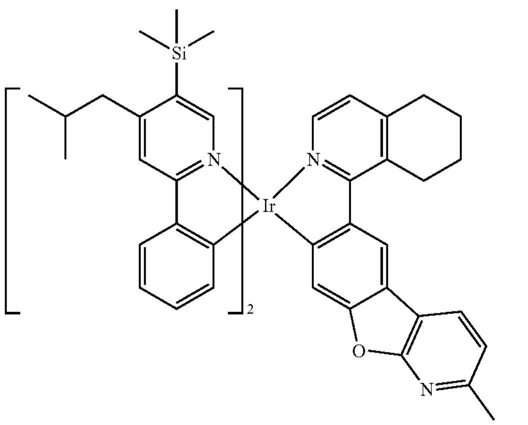
381
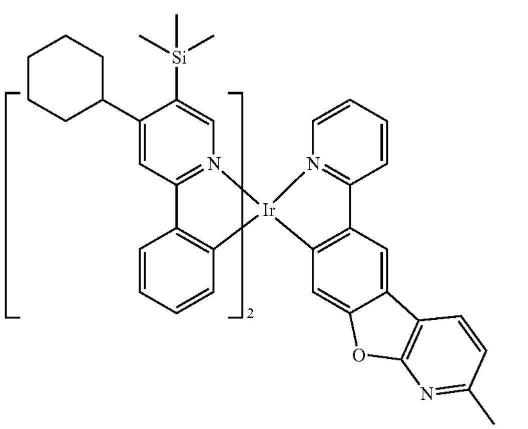
382
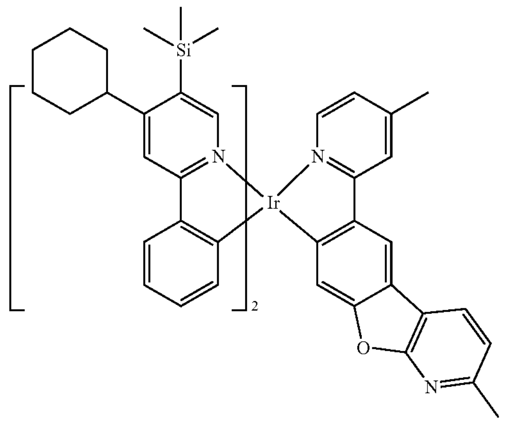
383
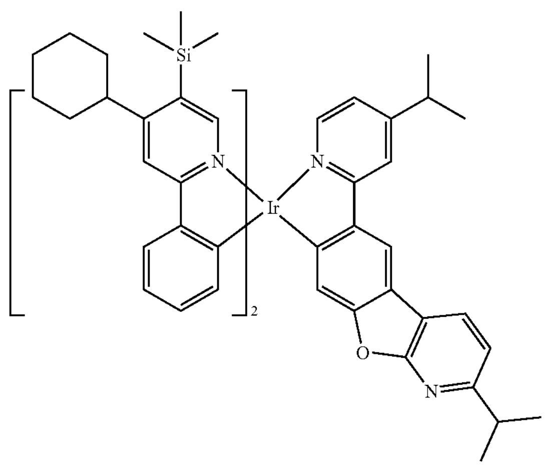
384
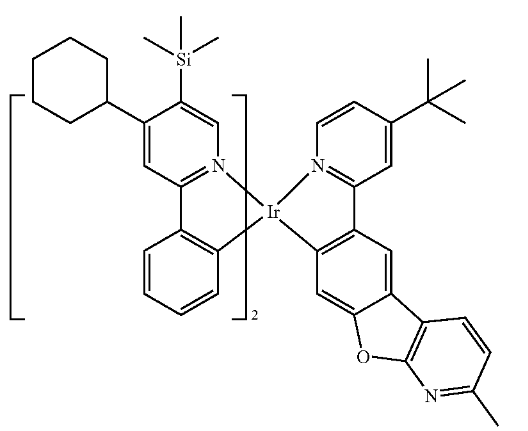

385
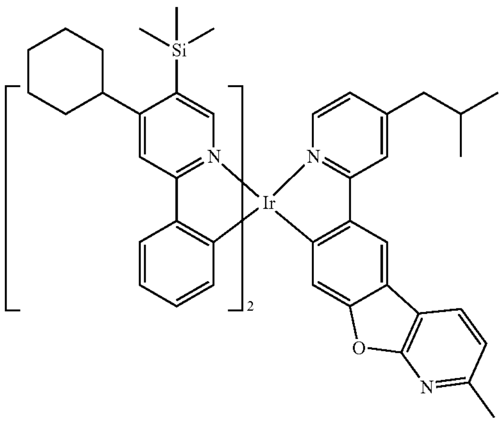
386
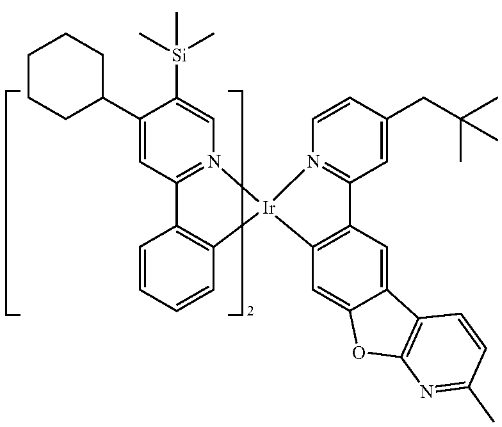
387
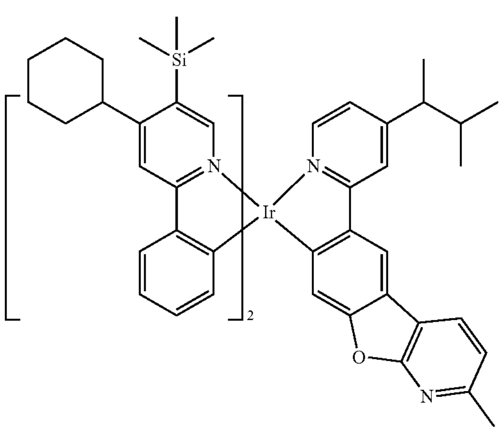
388
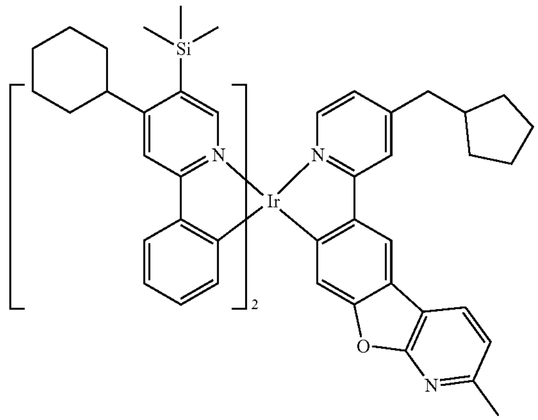
389
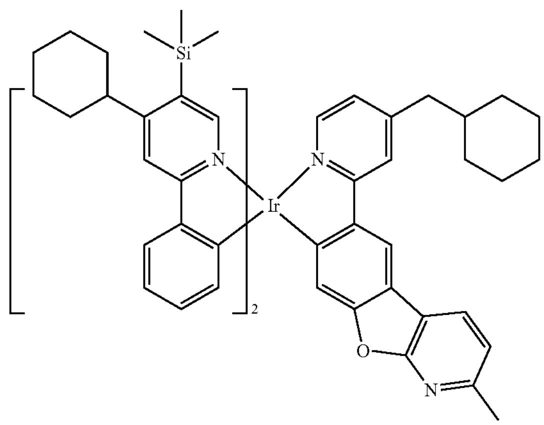
390
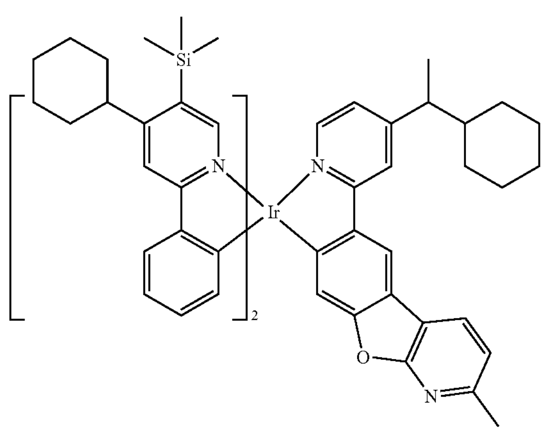

391
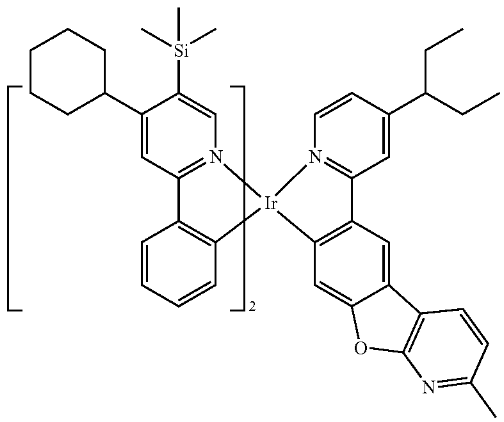
392
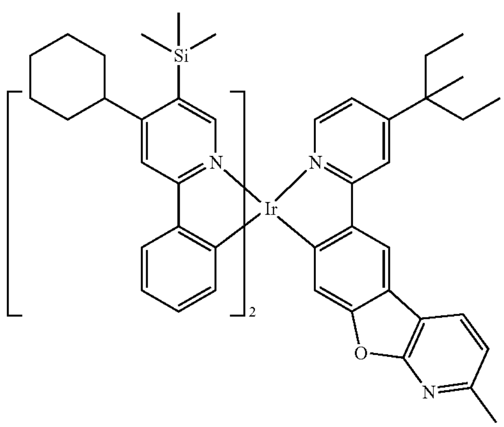
393
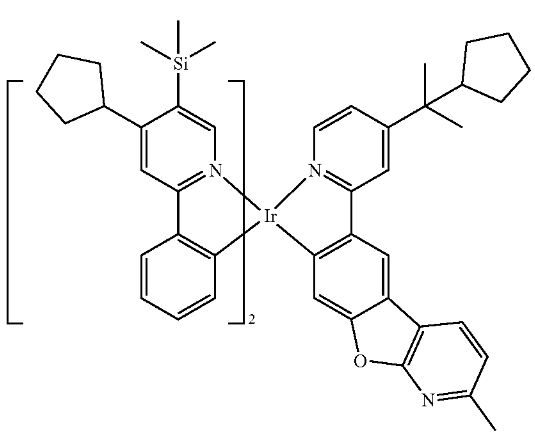
394
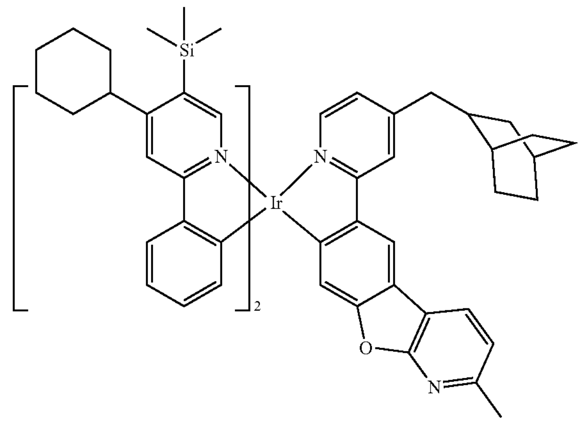
395
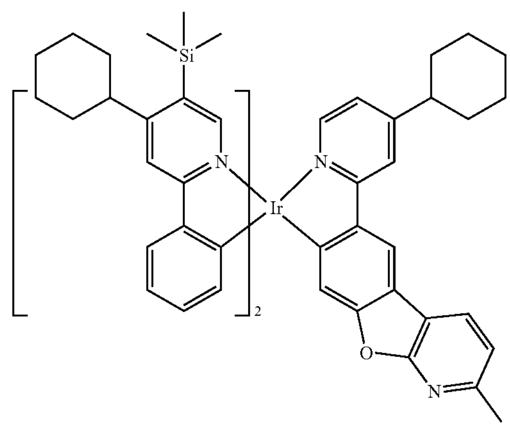
396
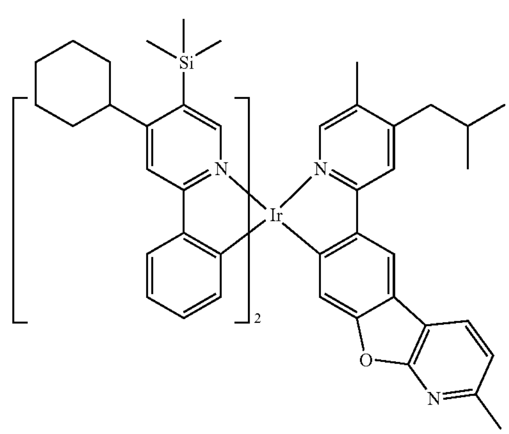

-continued
397
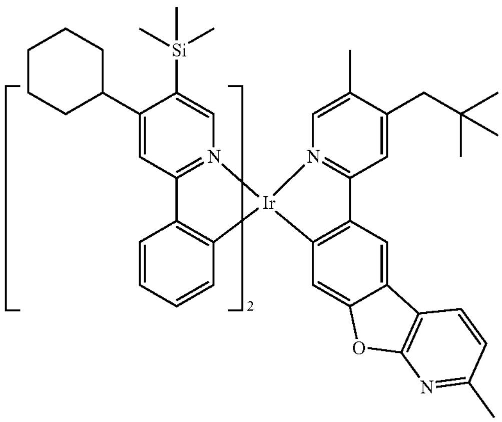
398
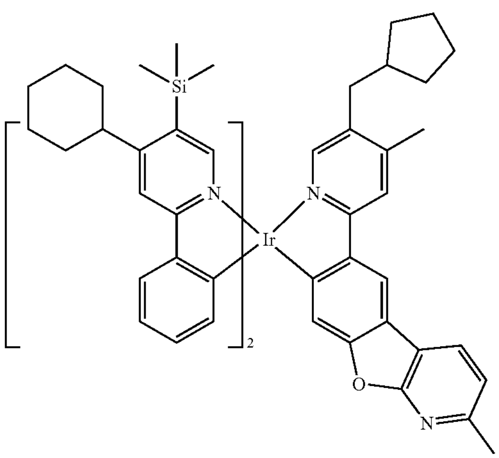
399
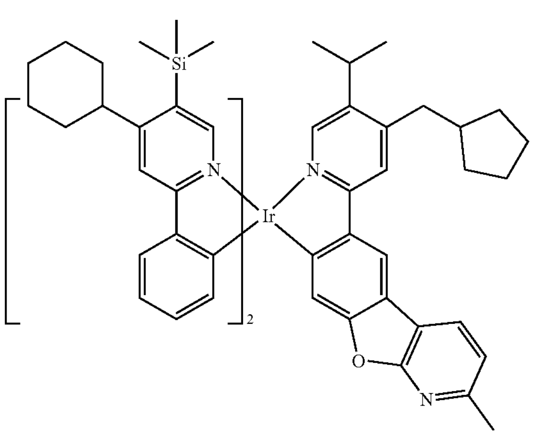
-continued
400
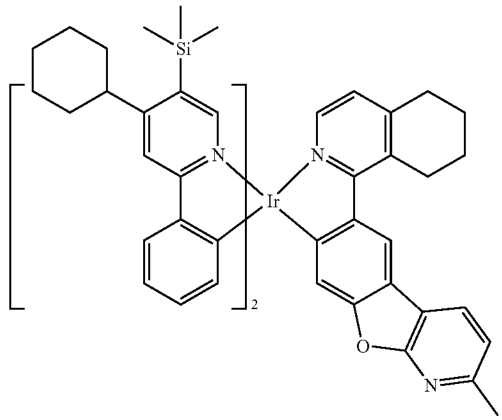
401
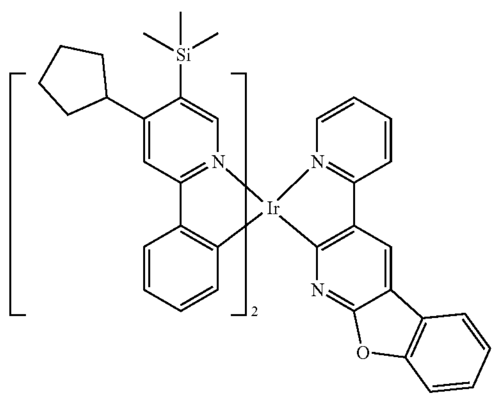
402
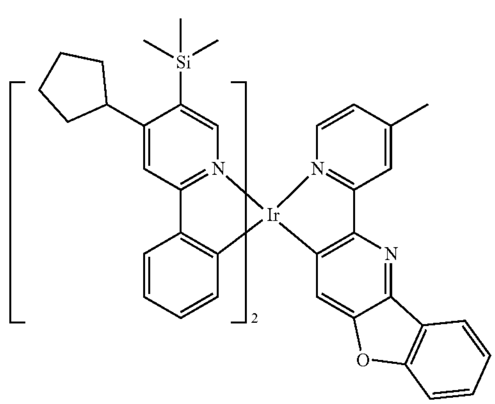

-continued
403
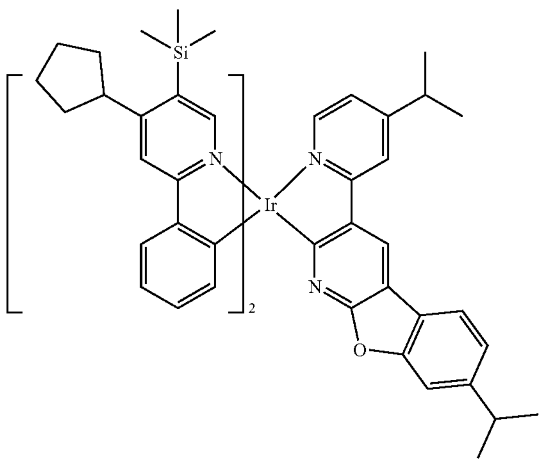
404
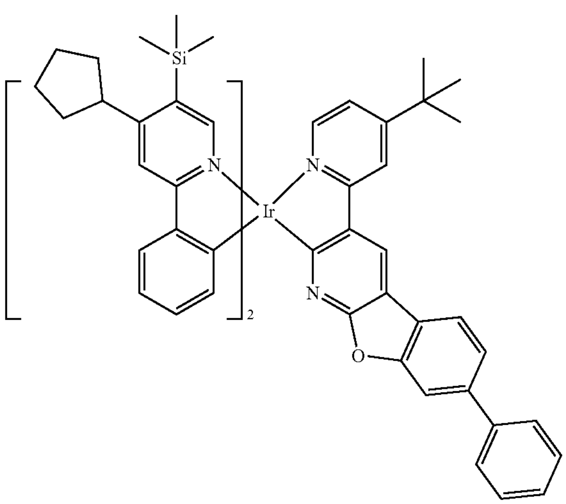
405
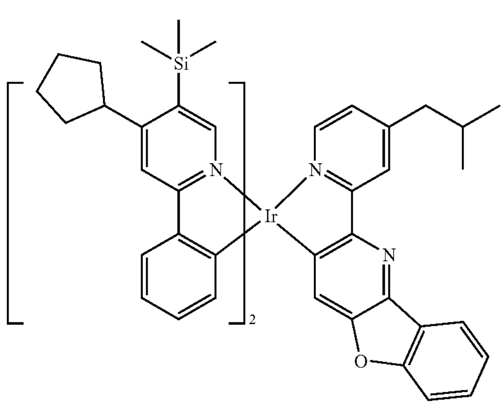
-continued
406
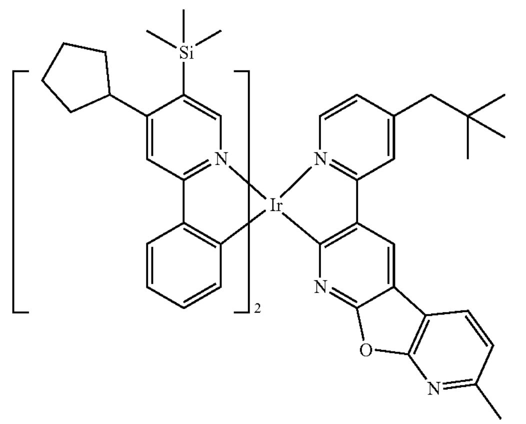
407
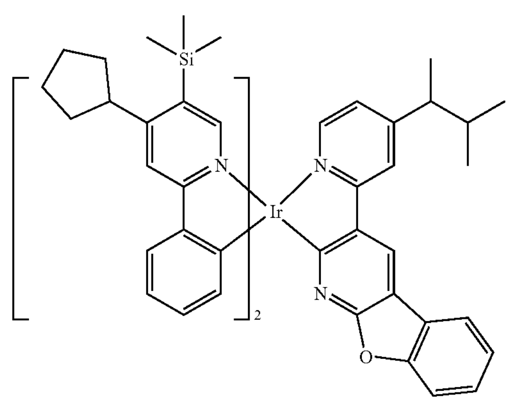
408
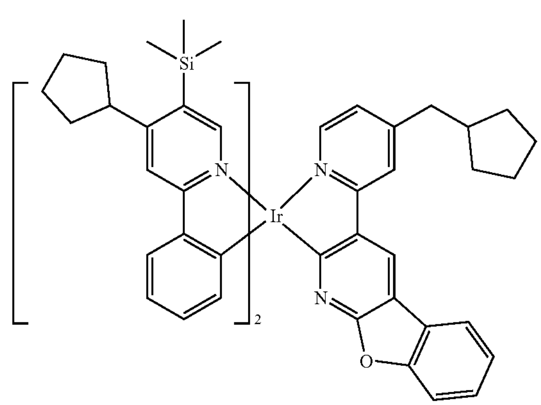

-continued
409
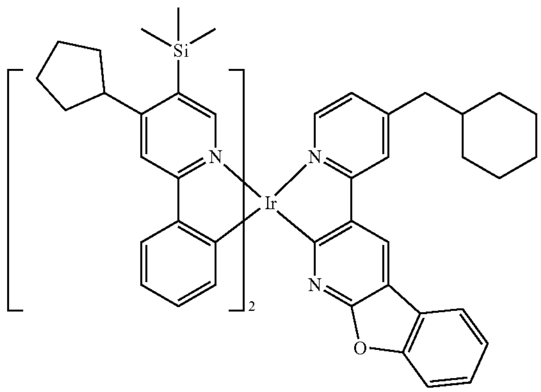
410
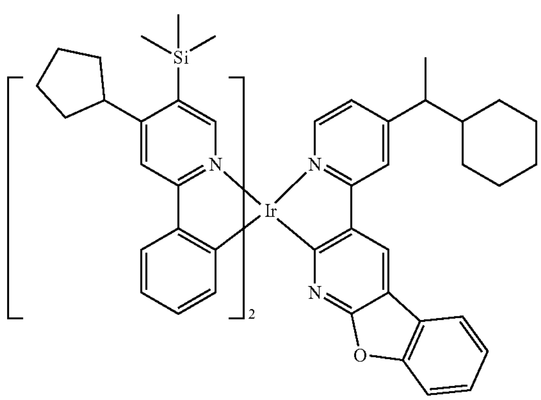
411
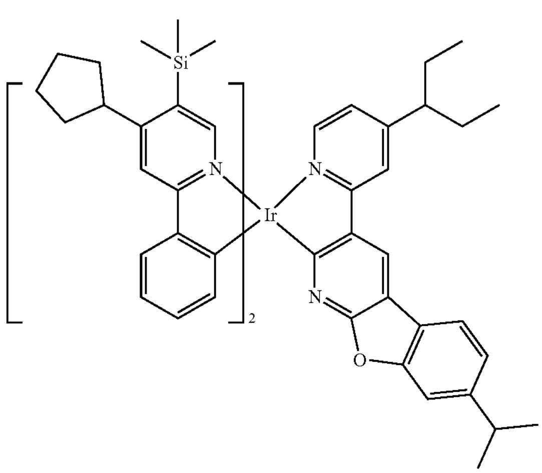
-continued
412
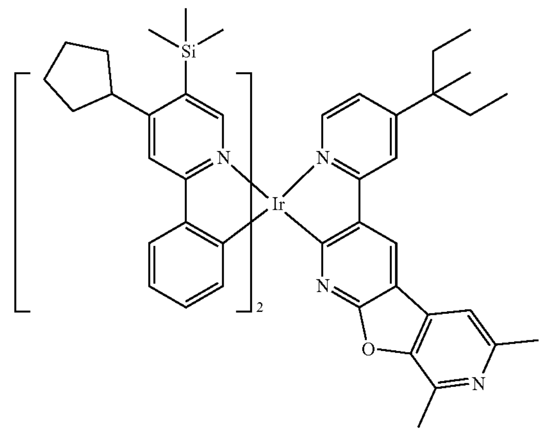
413
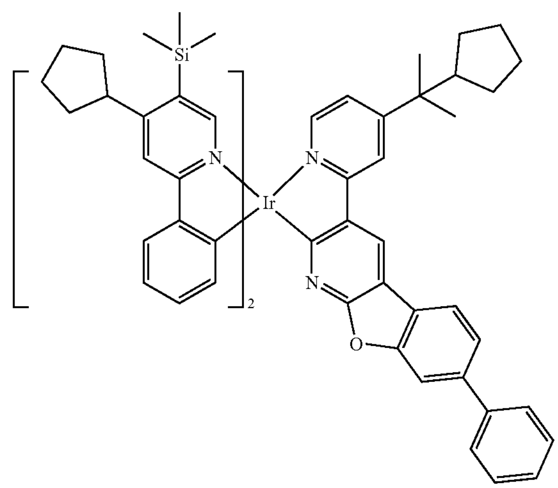
414
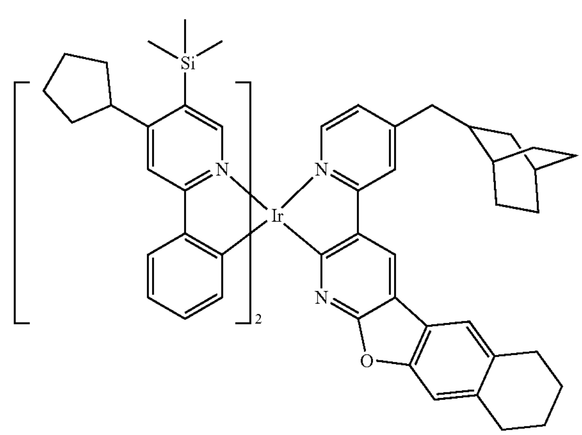

415
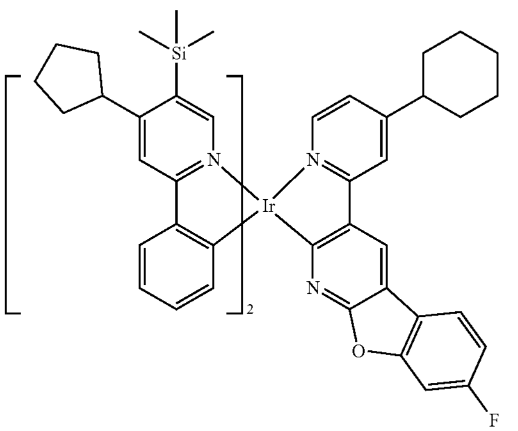
416
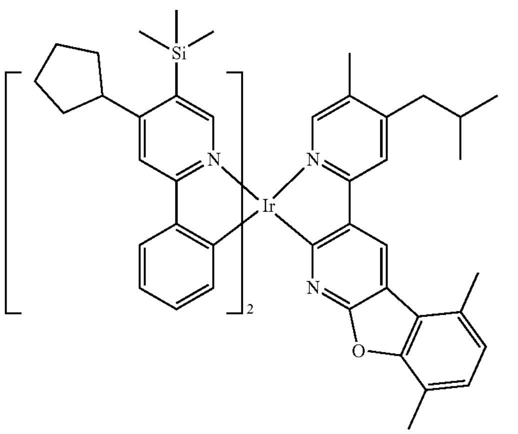
417
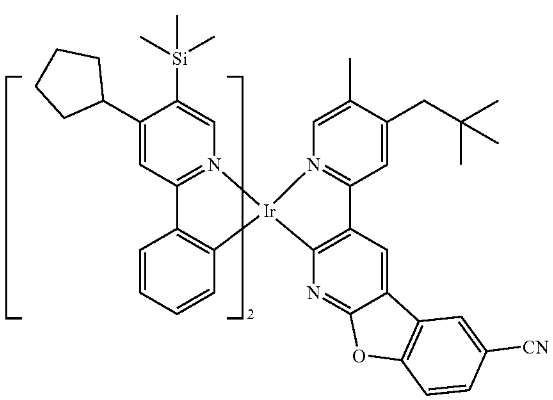
418
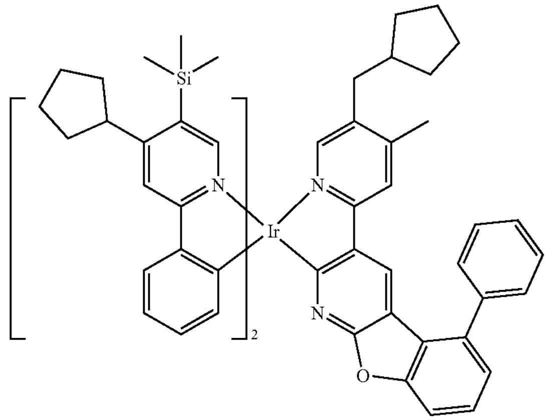
419
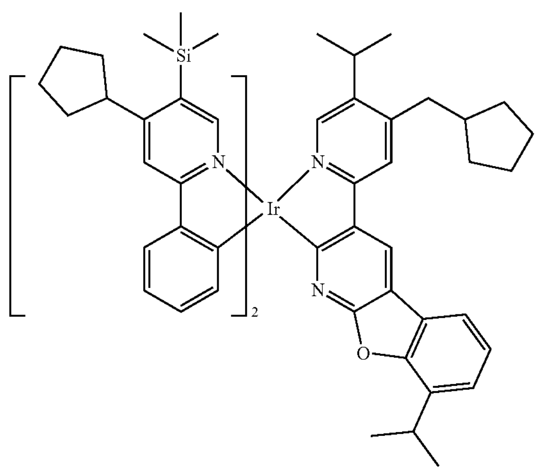
420
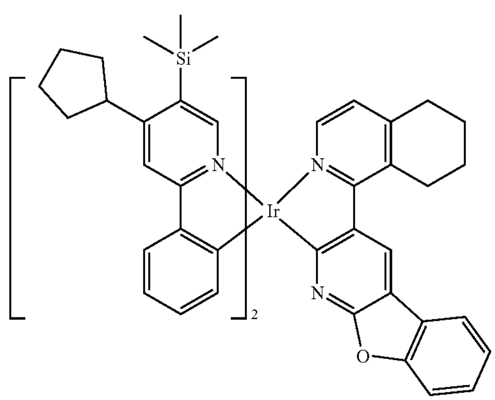

421
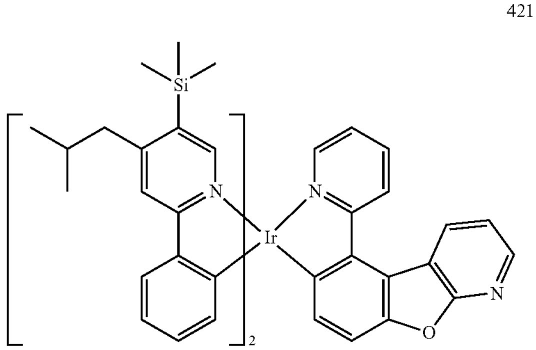
422
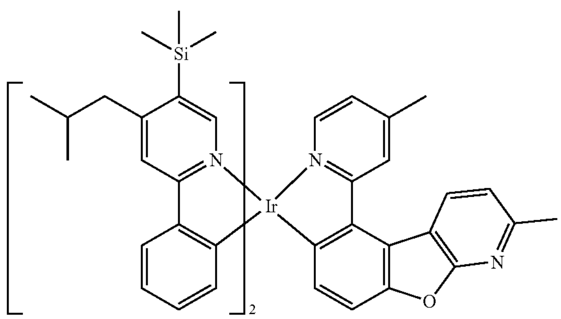
423
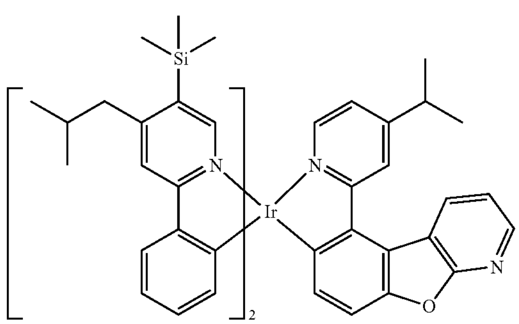
424
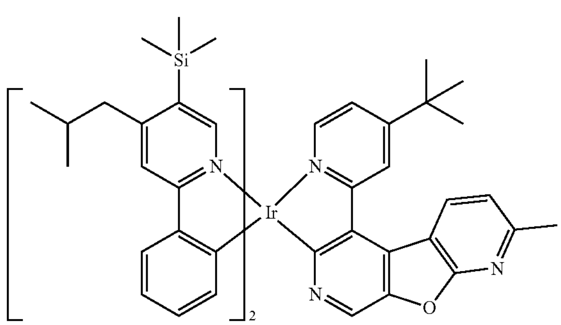
425
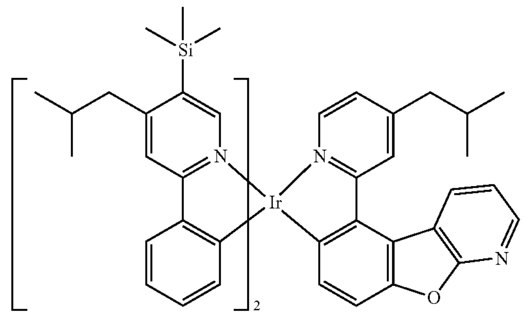
426
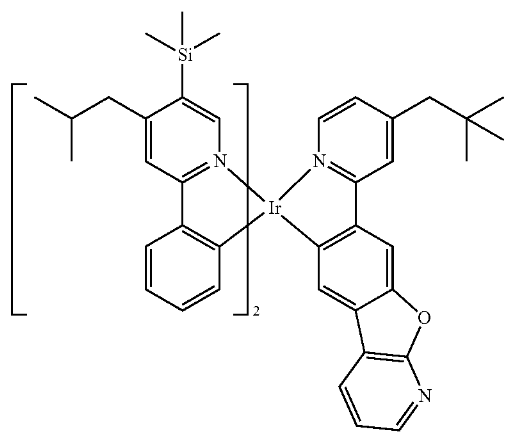
427
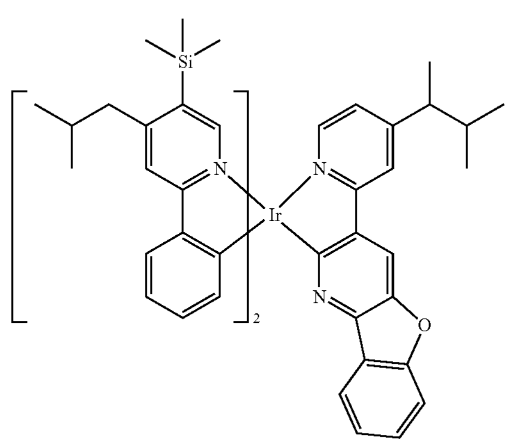

-continued
428
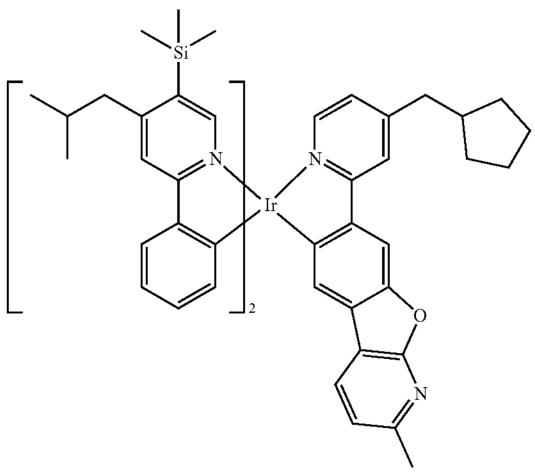
429
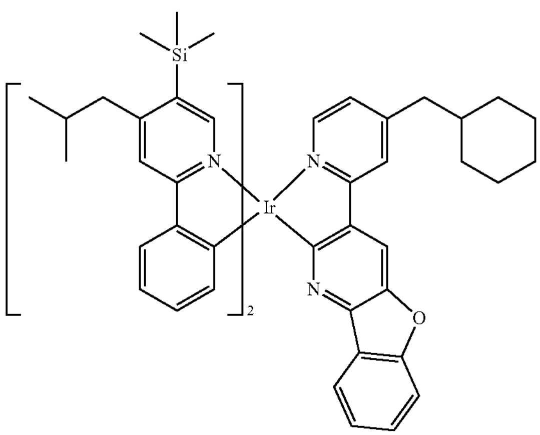
430
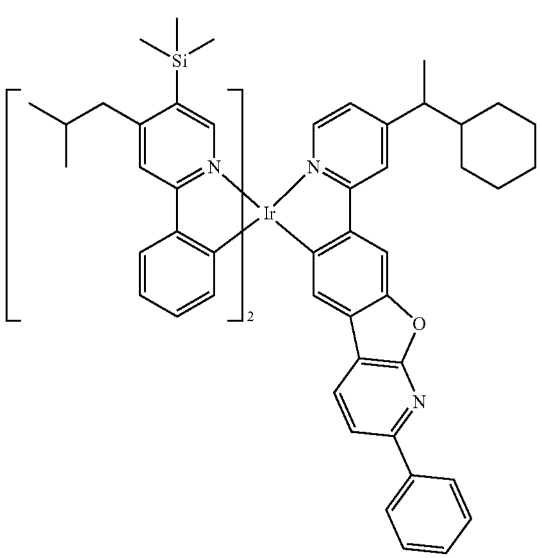
-continued
431
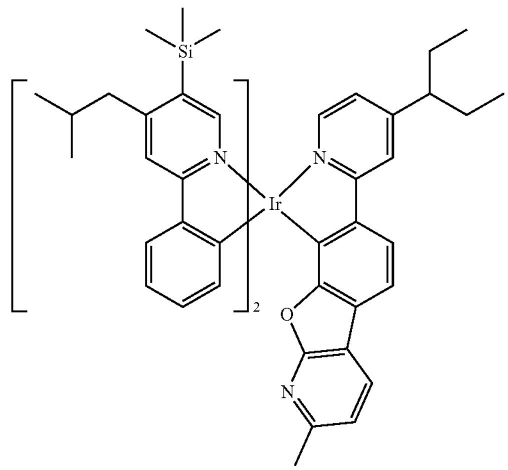
432
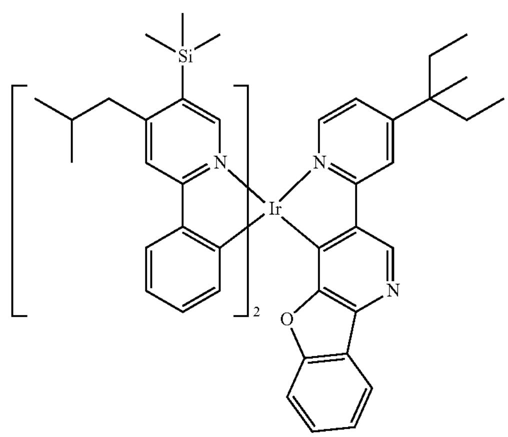
433
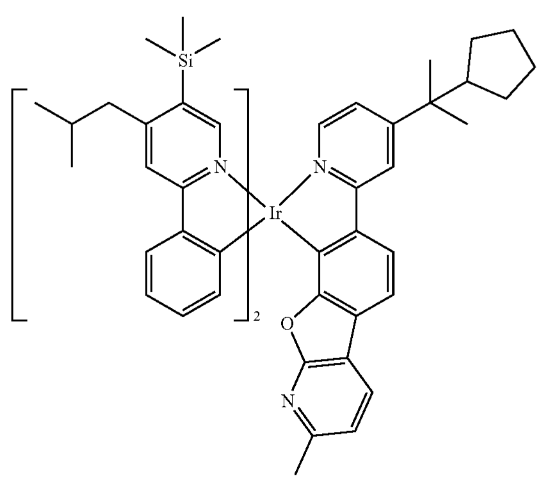

-continued
434
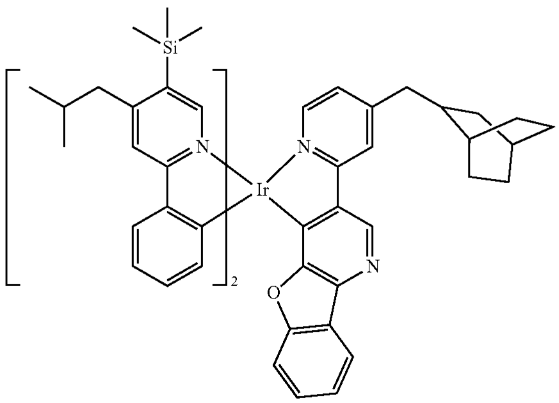
435
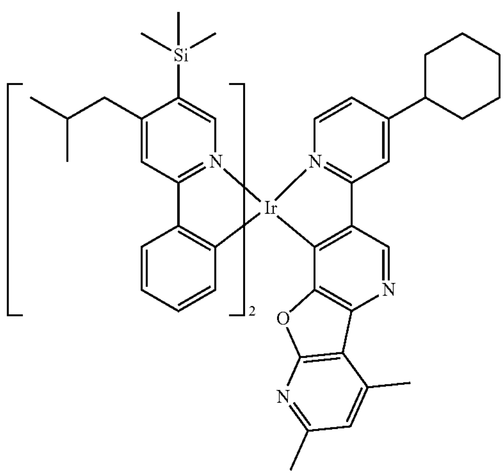
436
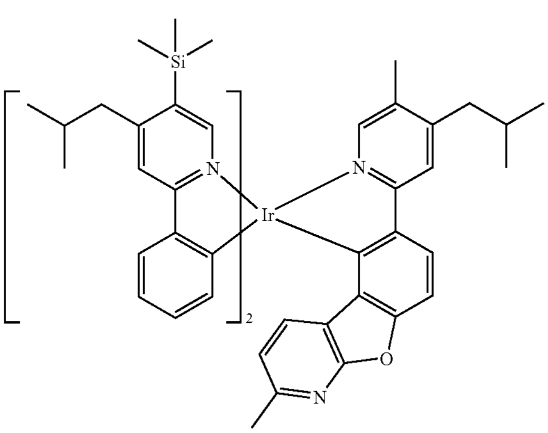
-continued
437
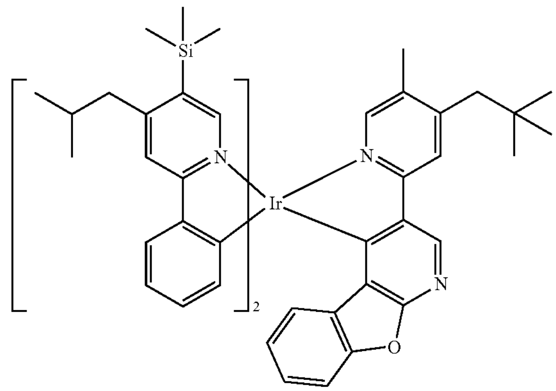
438
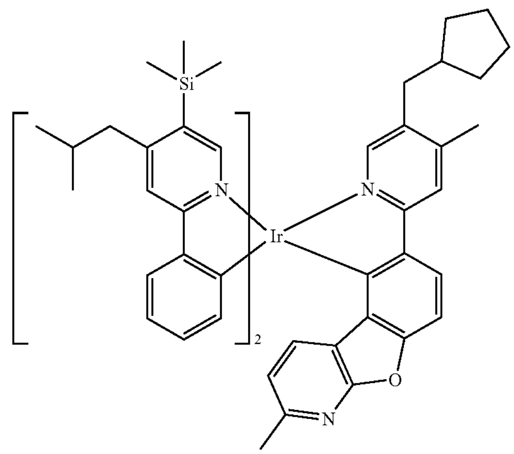
439
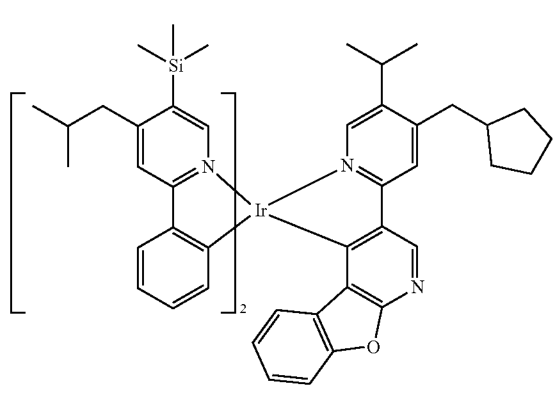

440
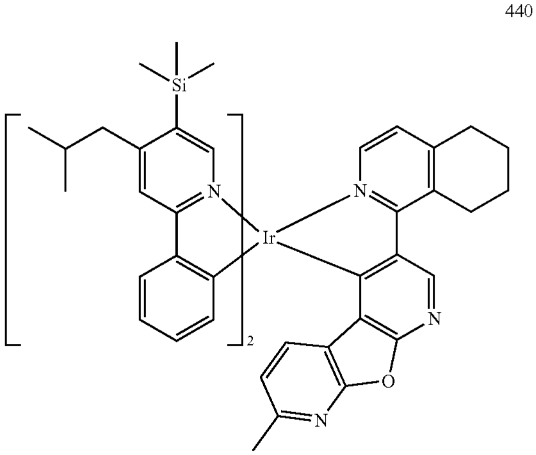
441
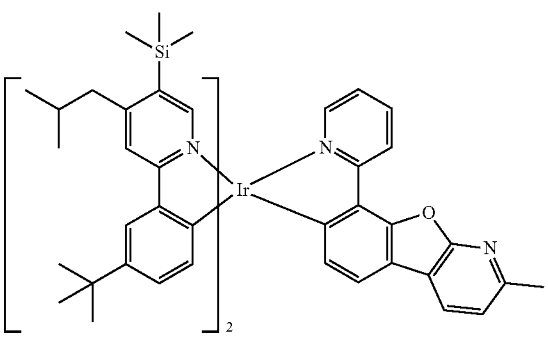
442
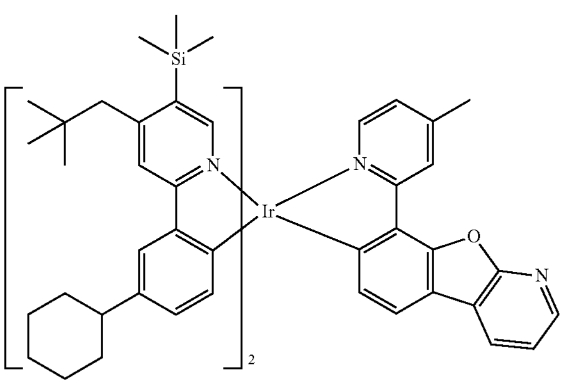
443
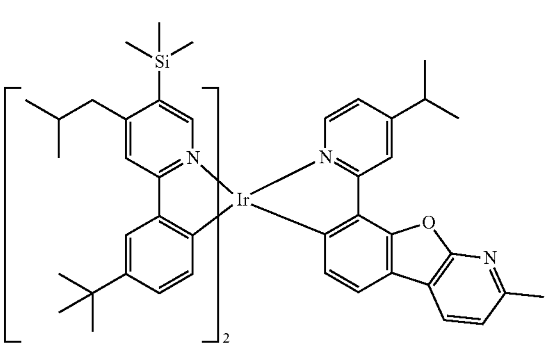
444
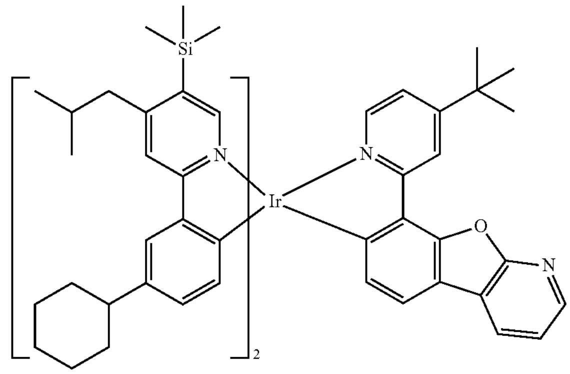
445
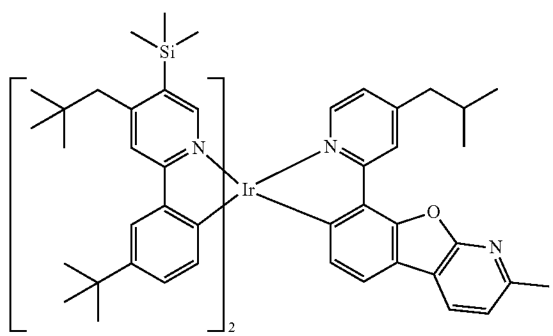
446
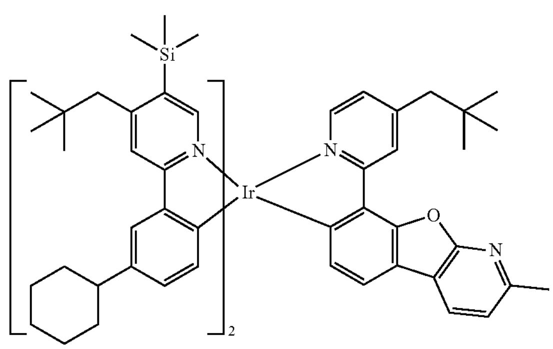
447
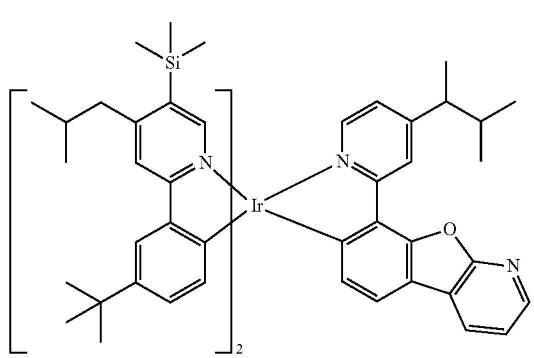

-continued
448
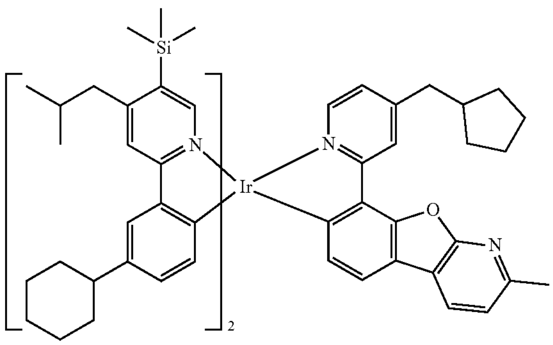
449
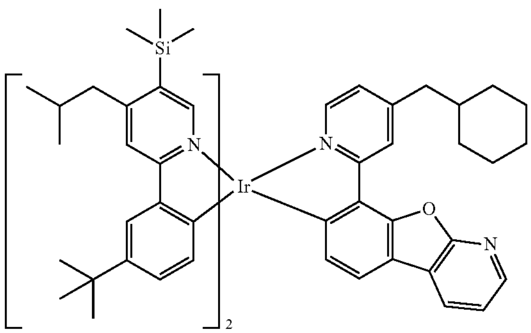
450
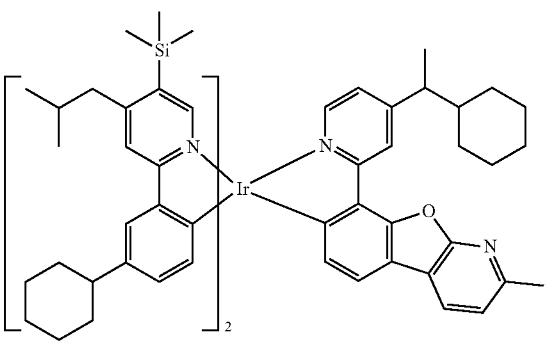
451
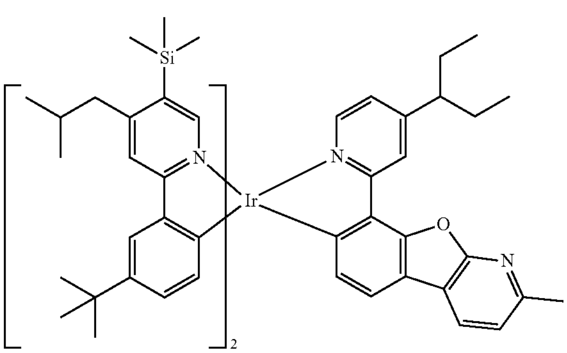
-continued
452
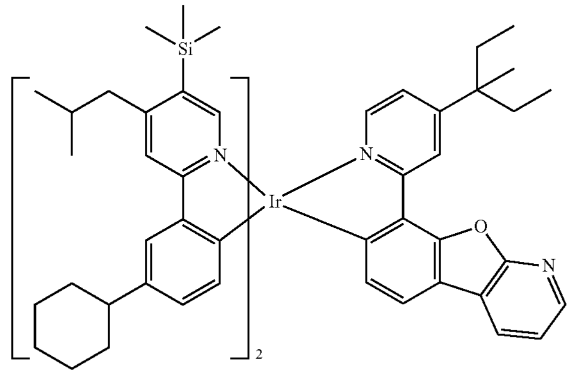
453
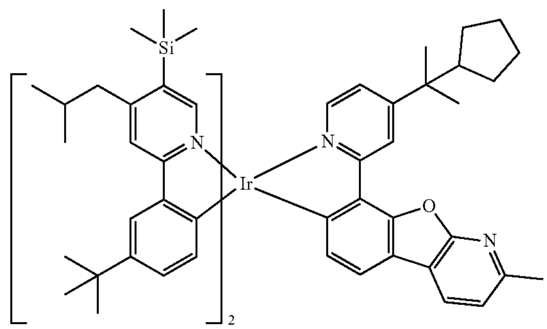
454
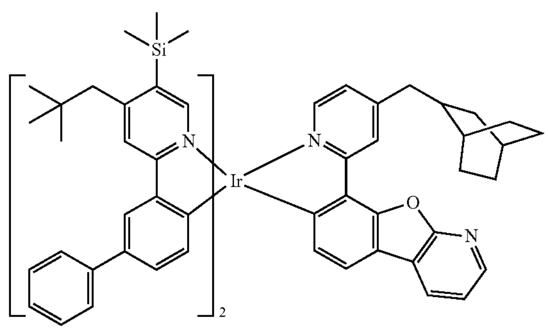
455
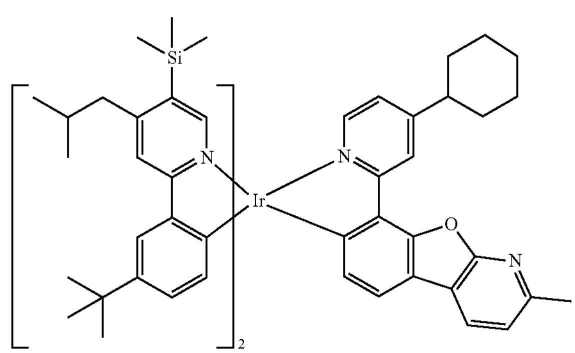

456
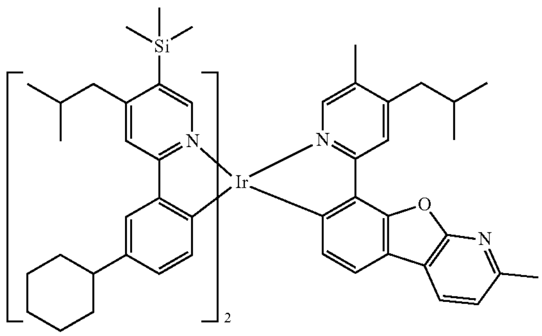
457
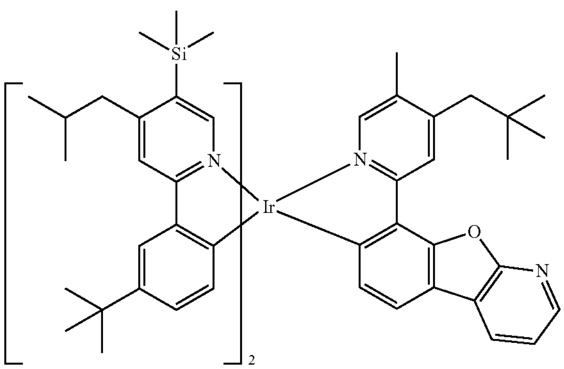
458
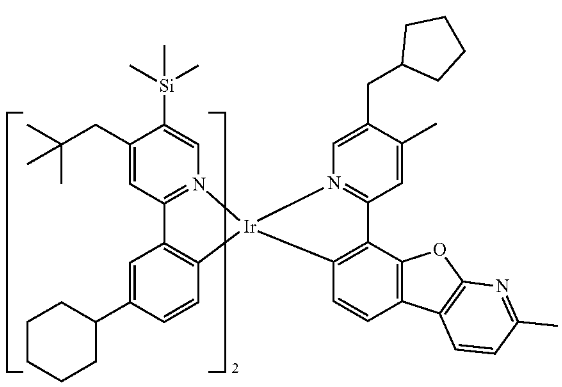
459
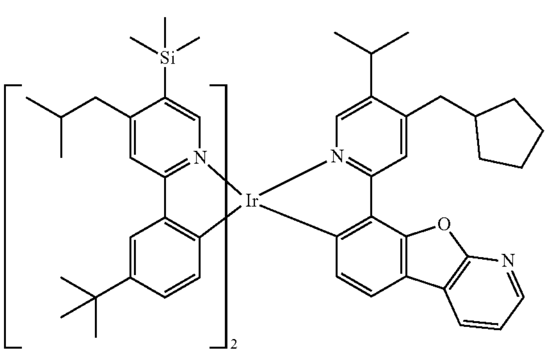
460
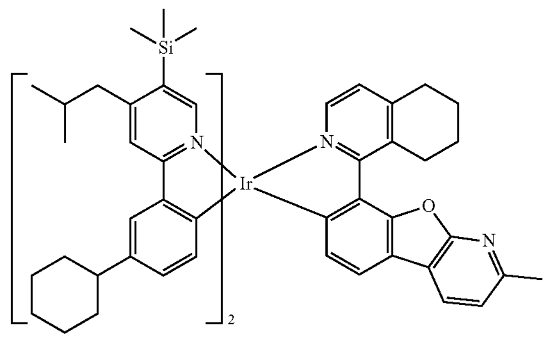
461
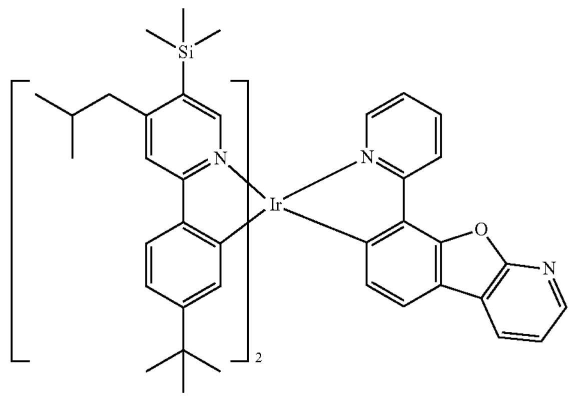
462
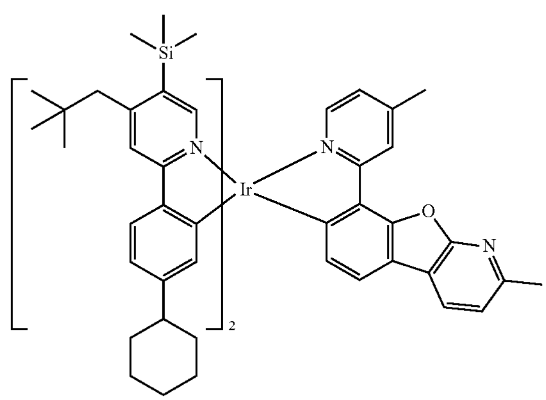
463
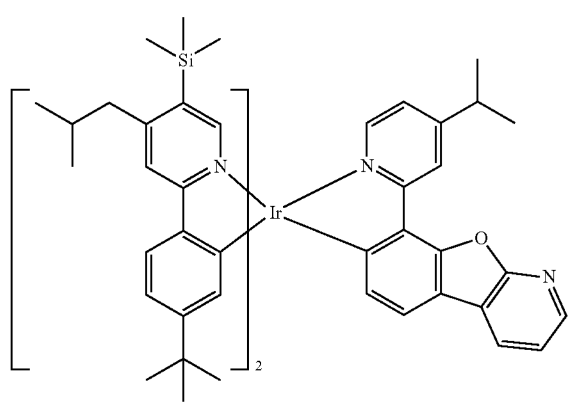

-continued
464
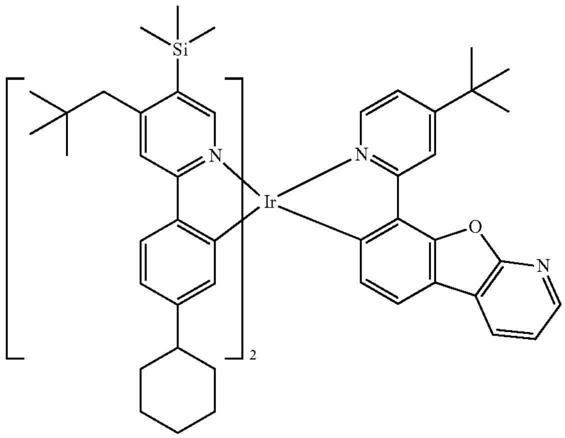
465
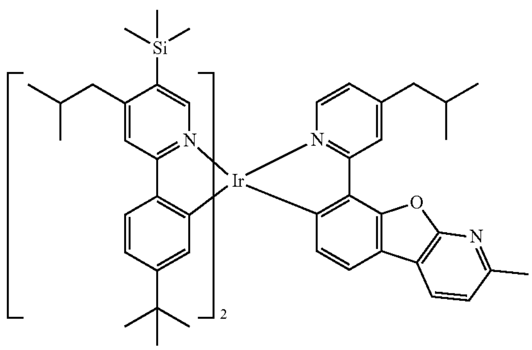
466
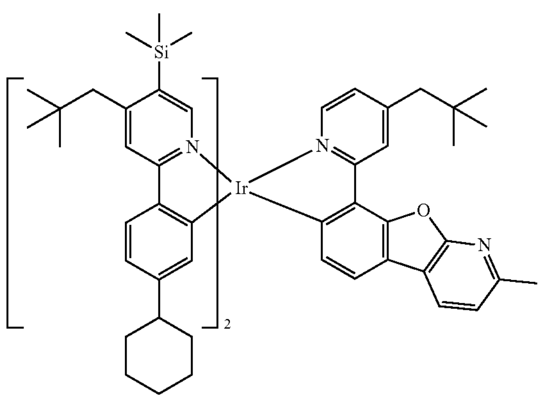
467
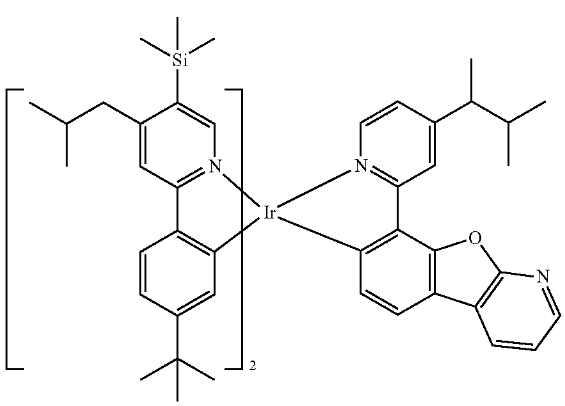
-continued
468
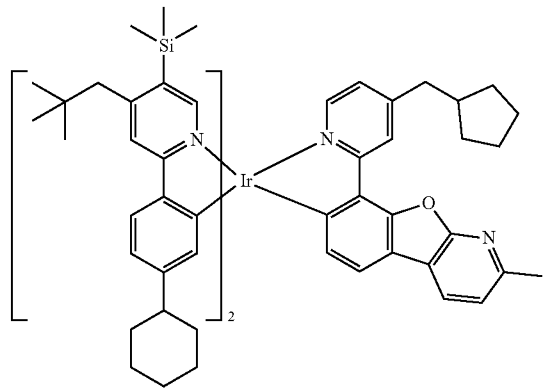
469
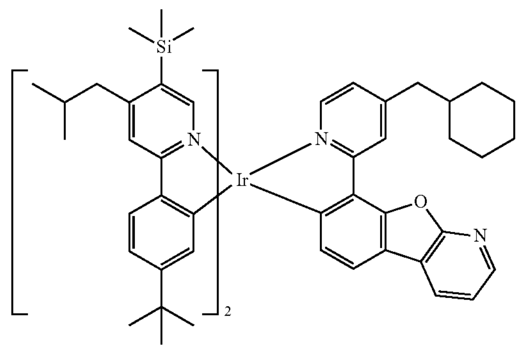
470
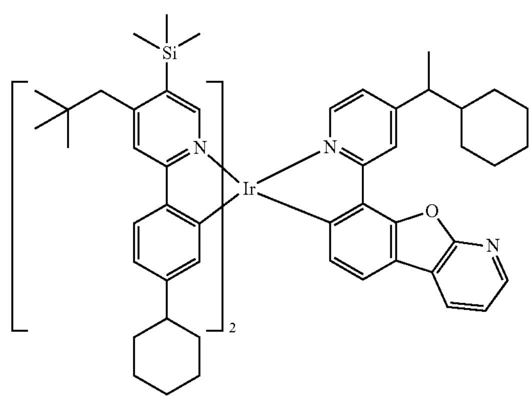
471
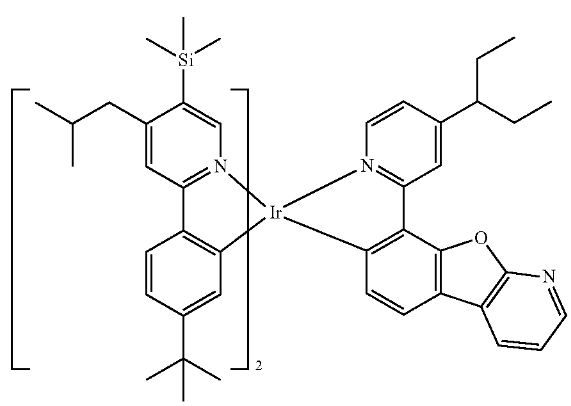

472
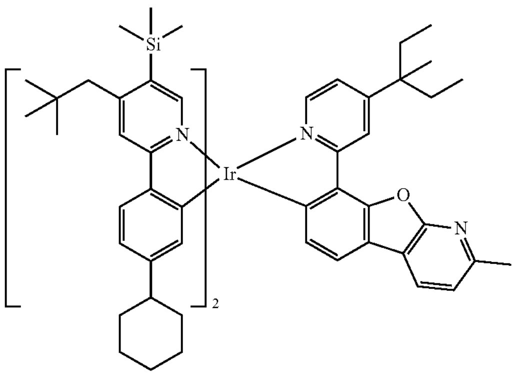
473
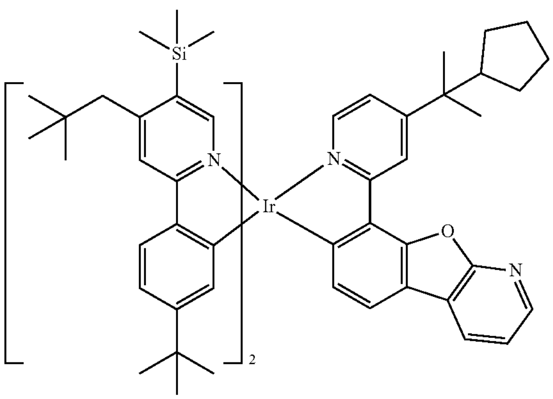
474
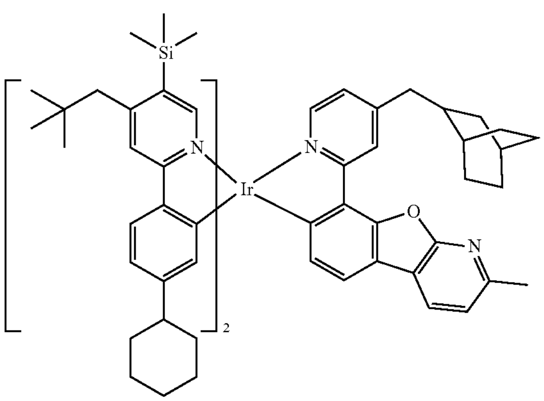
475
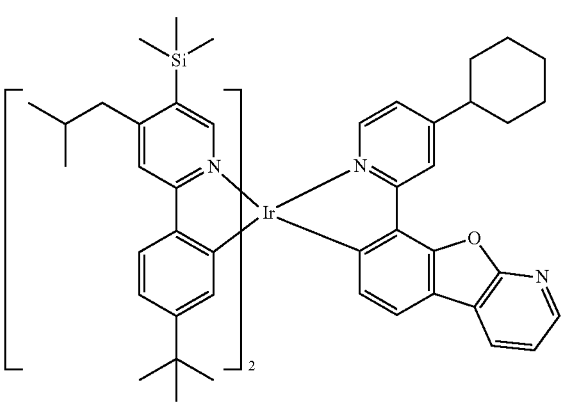
476
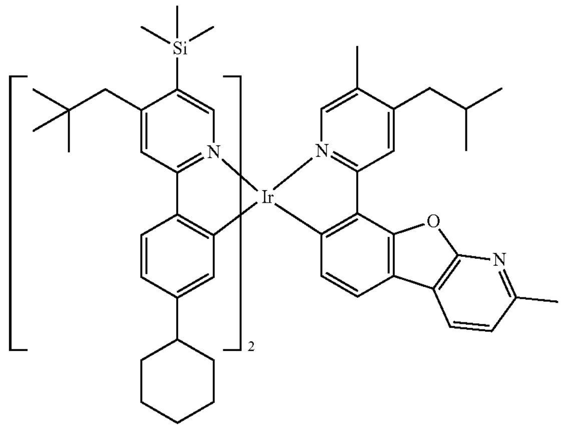
477
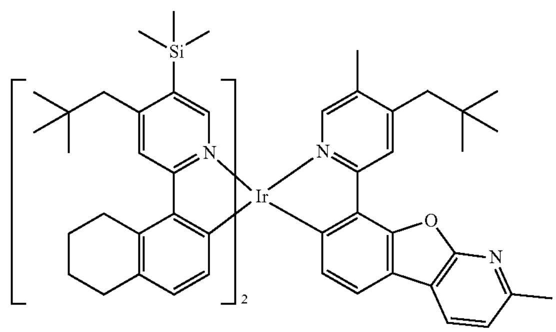
478
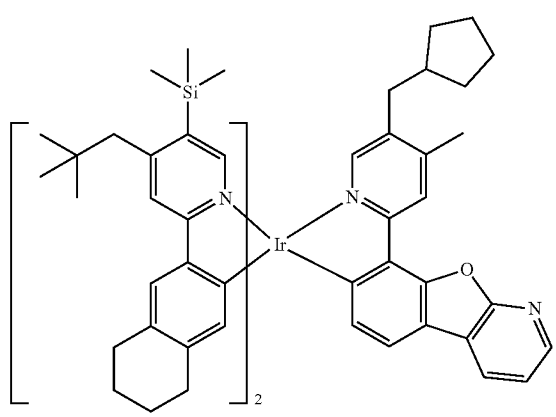
479
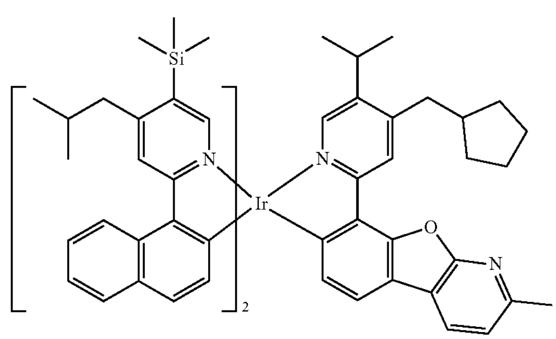

-continued
480
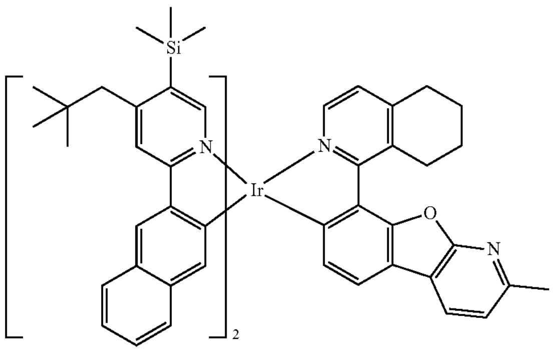
481
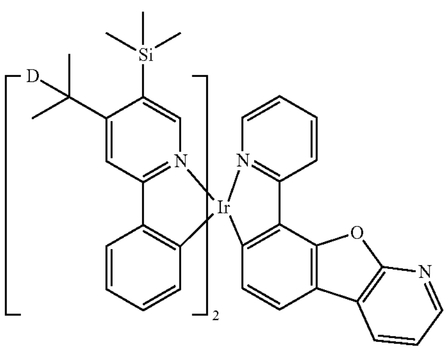
482
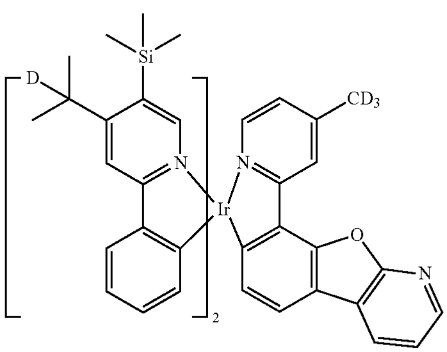
483
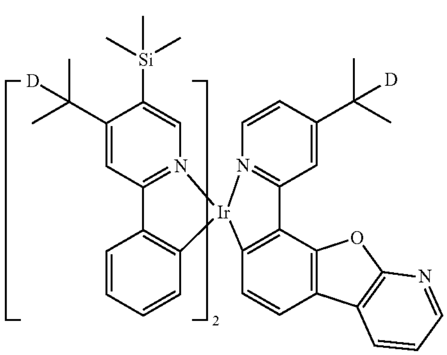
-continued
484
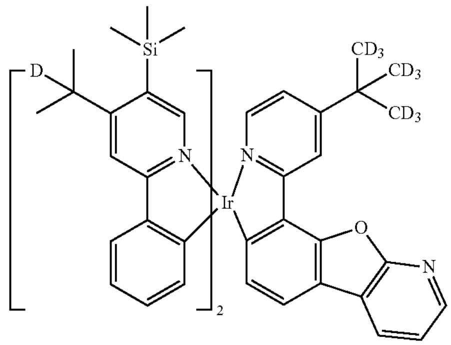
485
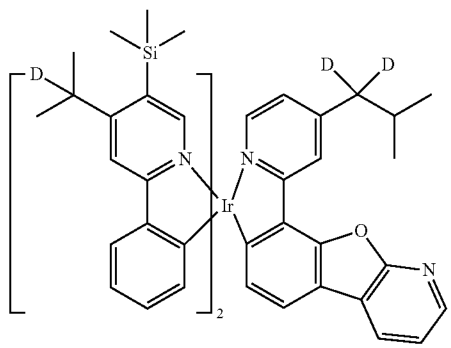
486
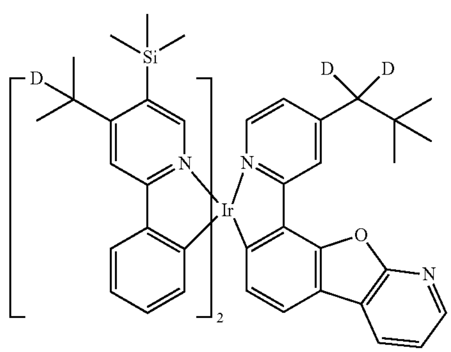
487
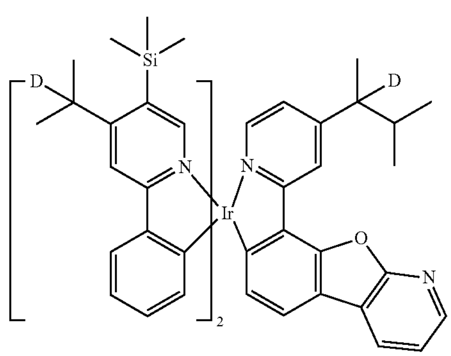

-continued
488
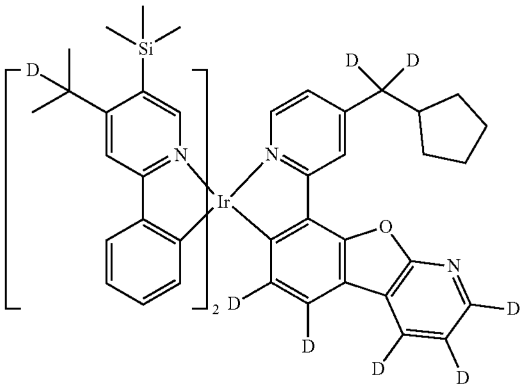
489
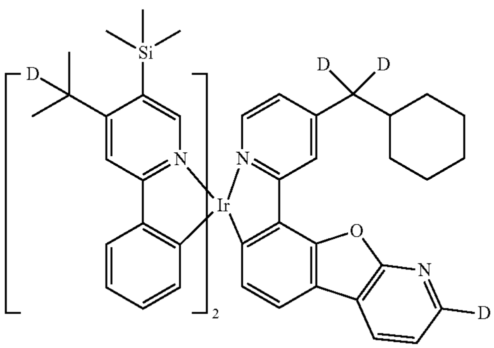
490
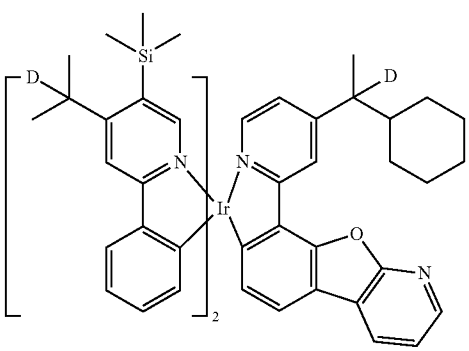
491
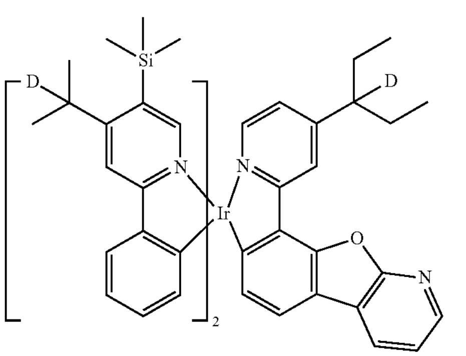
492
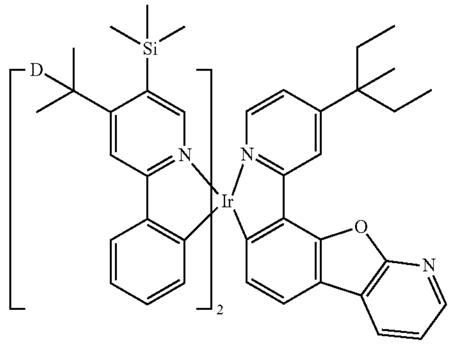
493
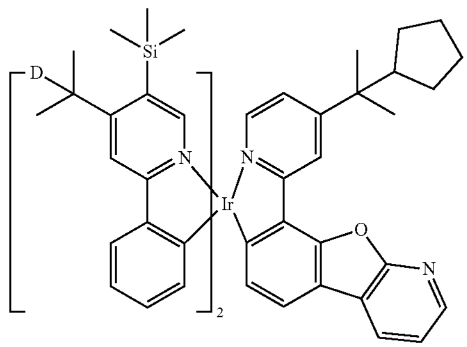
494
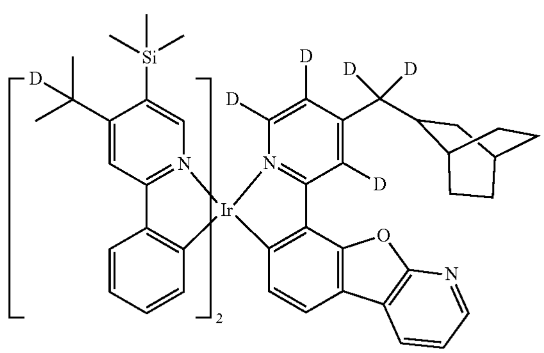
495
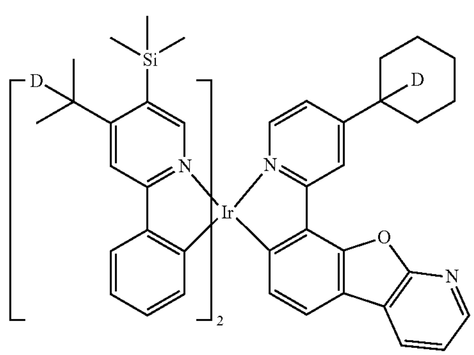

-continued
496
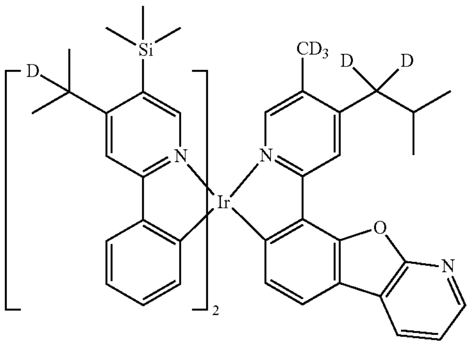
497
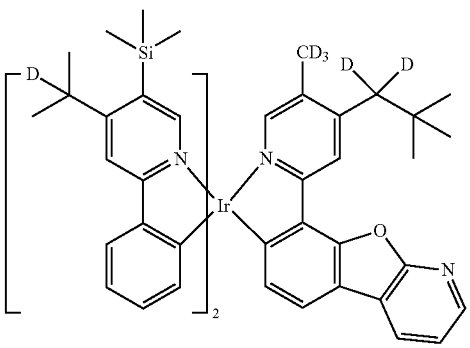
498
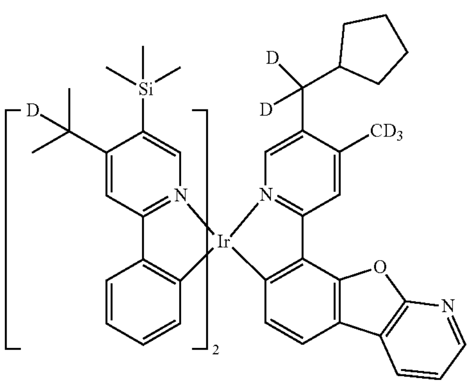
499
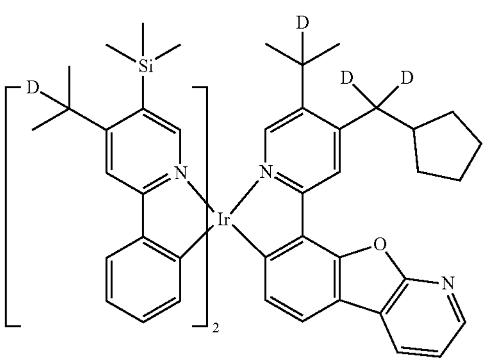
-continued
500
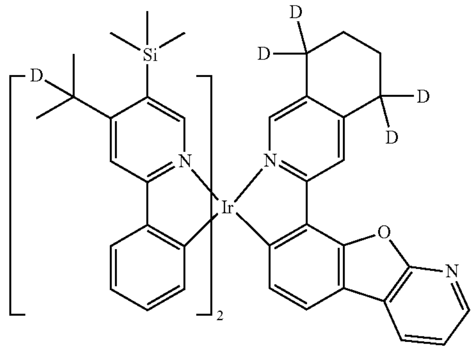
501
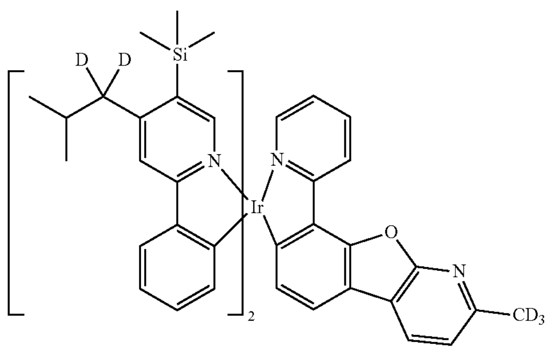
502
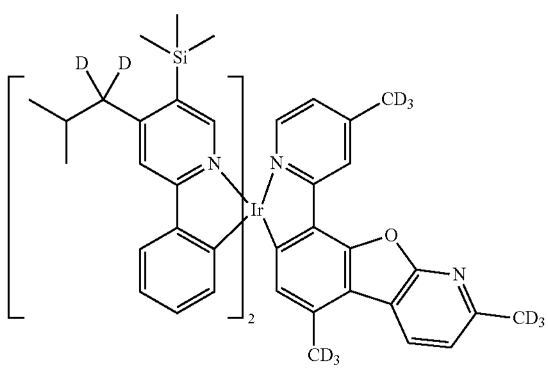
503
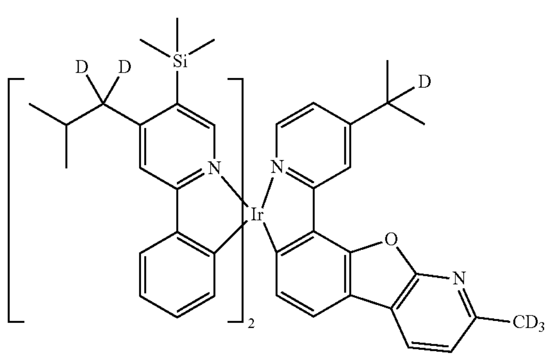

-continued
504
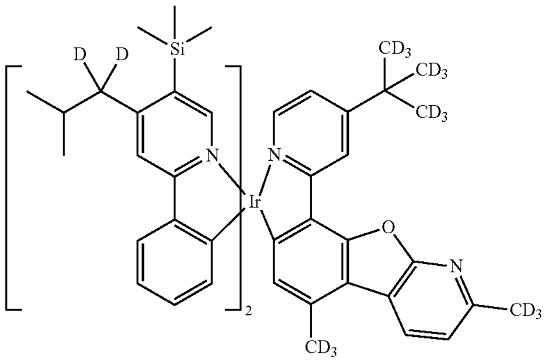
505
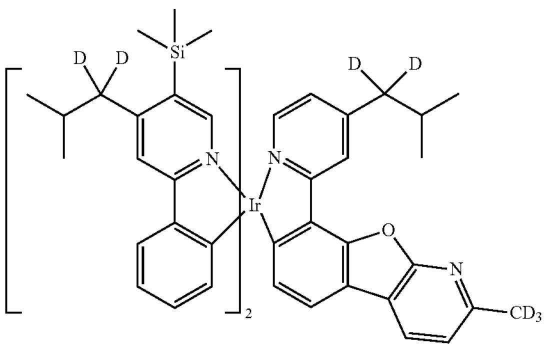
506
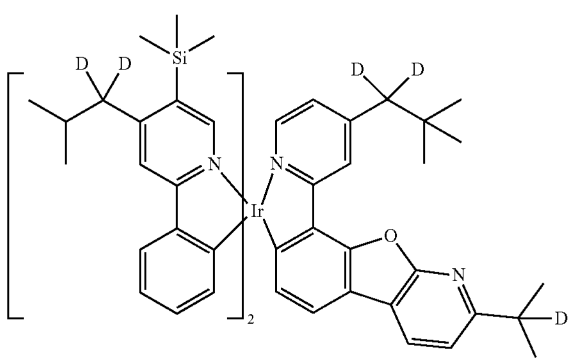
507
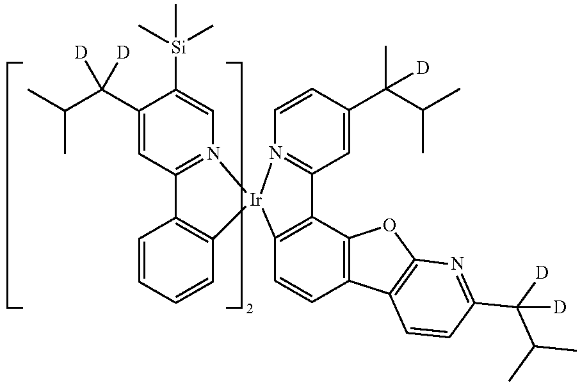
-continued
508
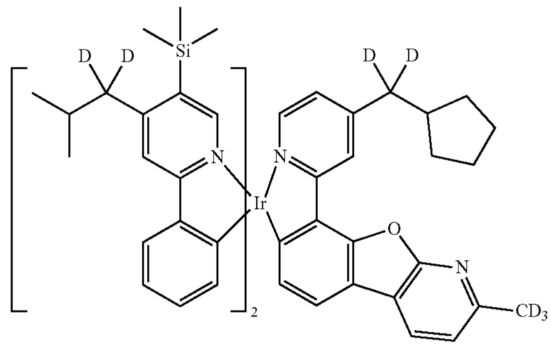
509
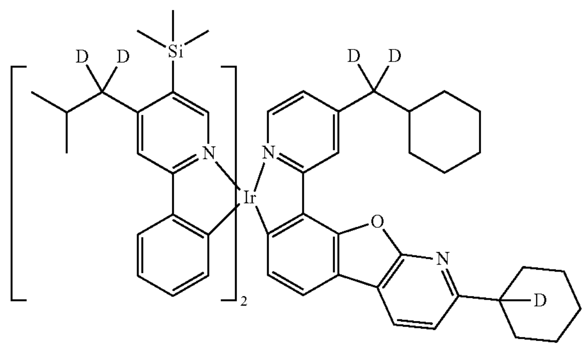
510
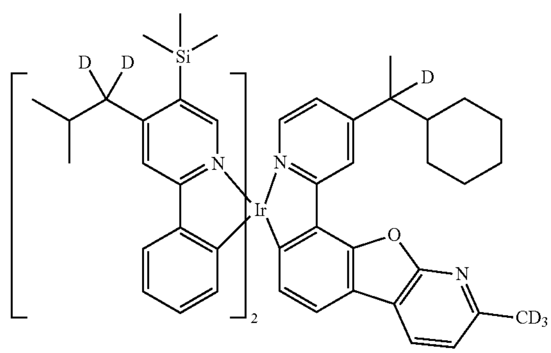
511
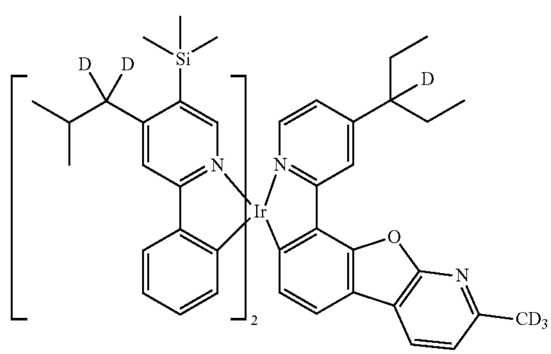

-continued
512
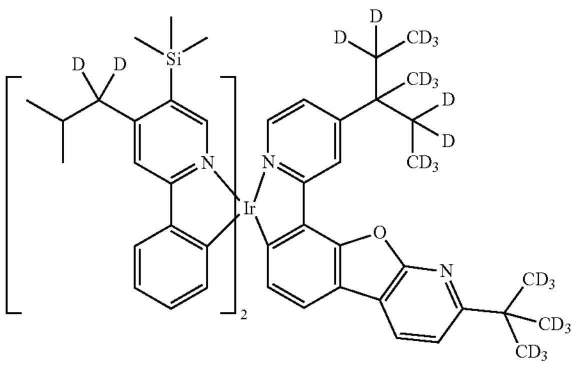
513
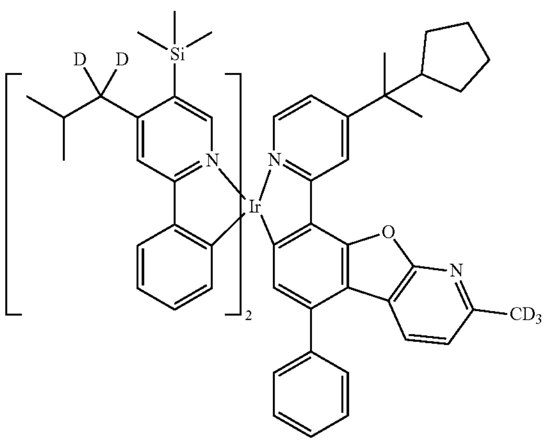
514
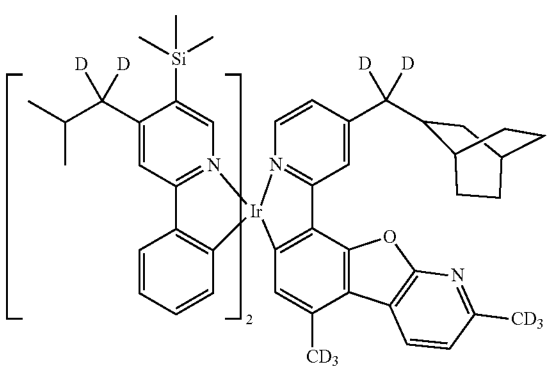
515
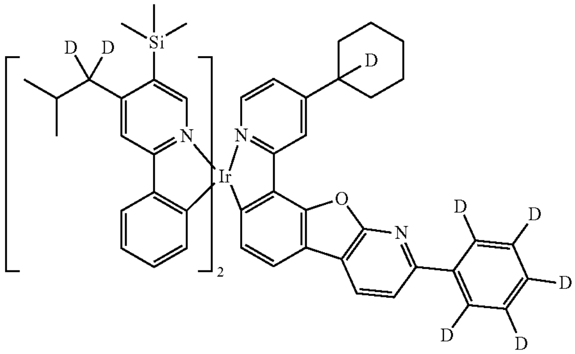
-continued
516
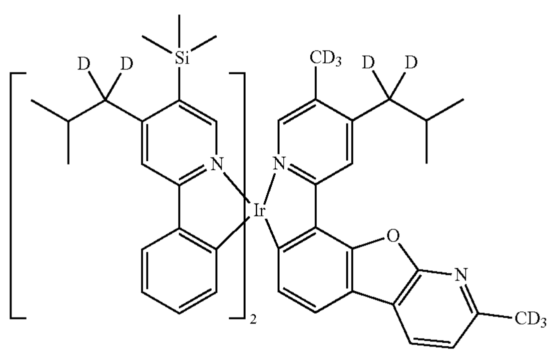
517
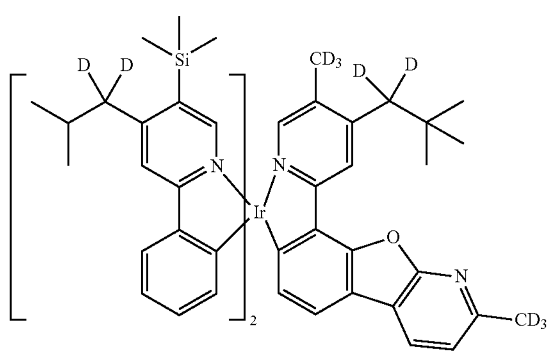
518
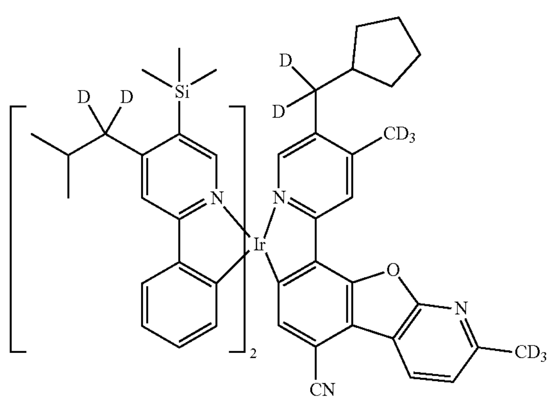
519
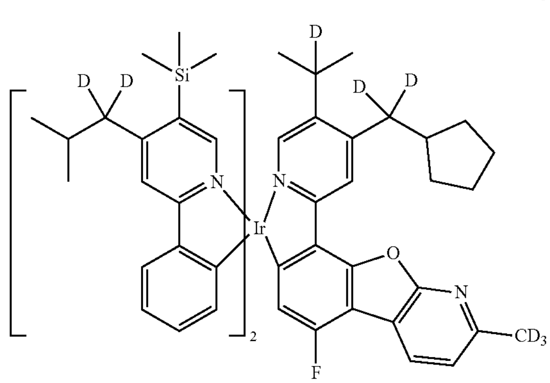

-continued
520
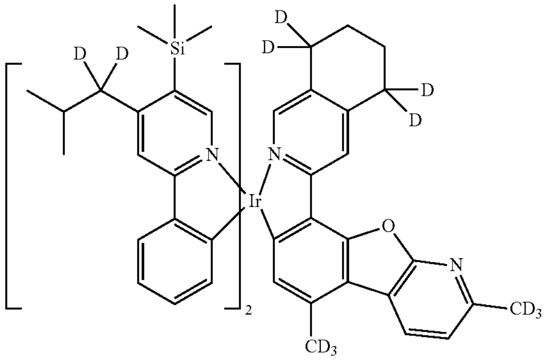
521
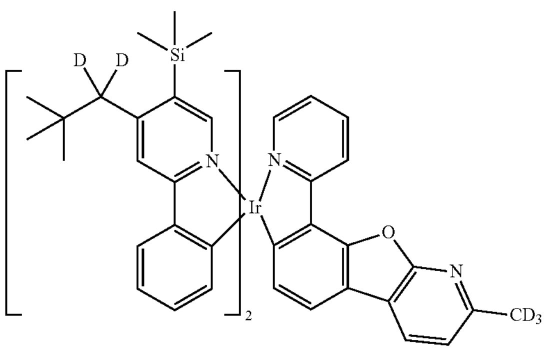
522
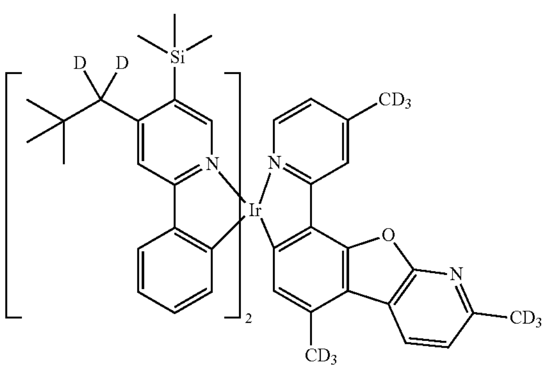
523
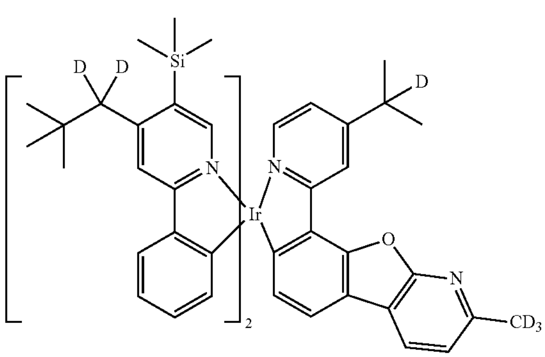
-continued
524
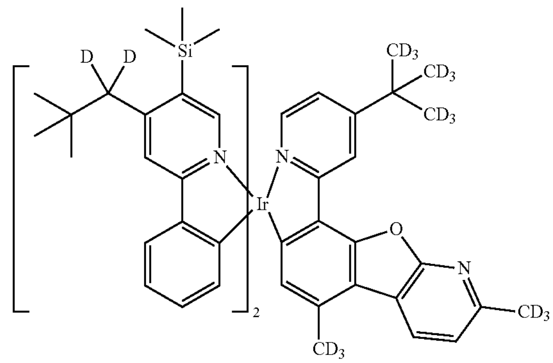
525
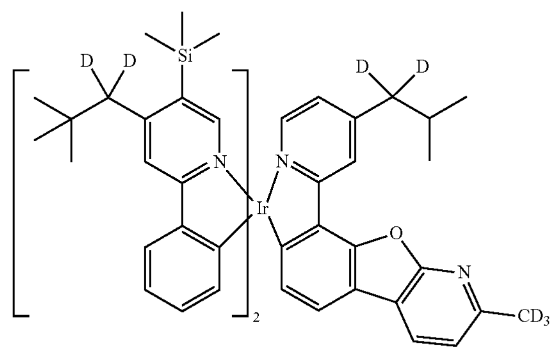
526
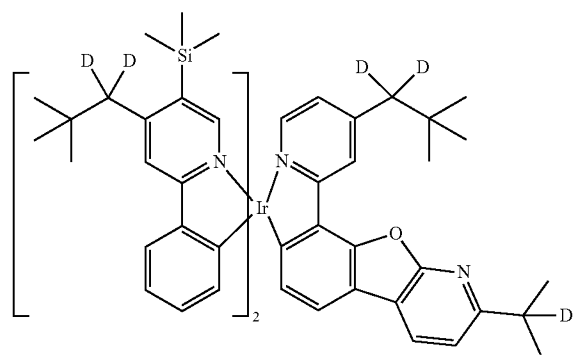
527
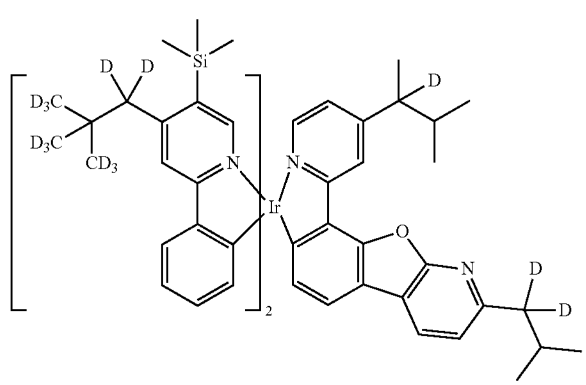

-continued
528
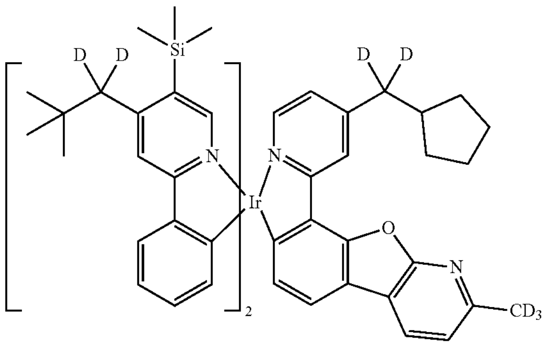
529
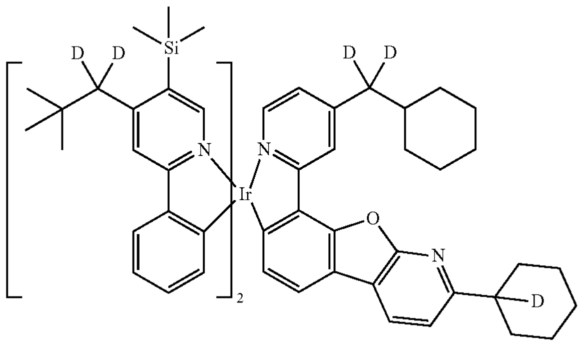
530
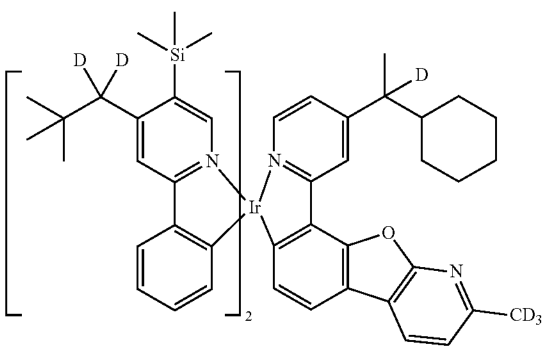
531
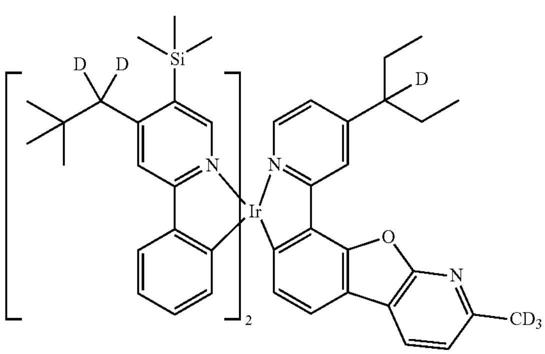
-continued
532
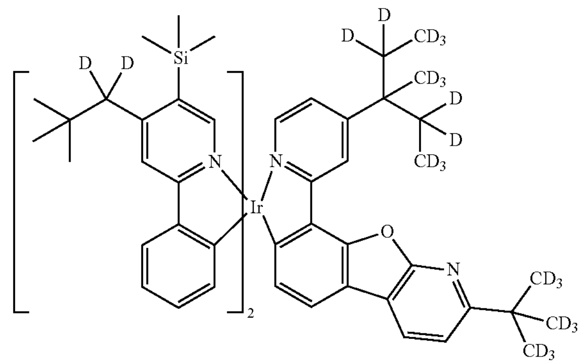
533
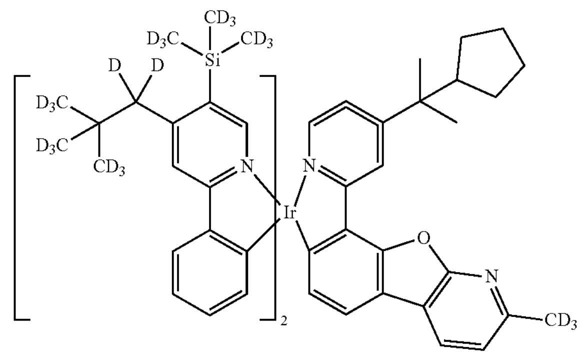
534
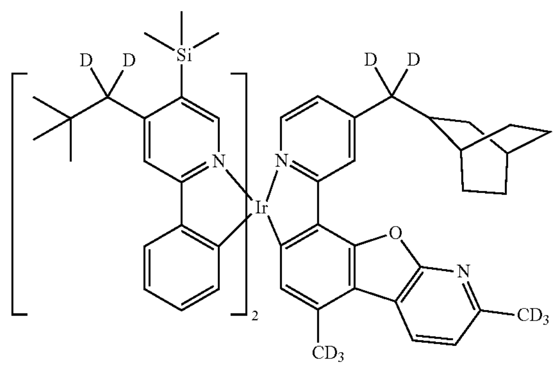
535
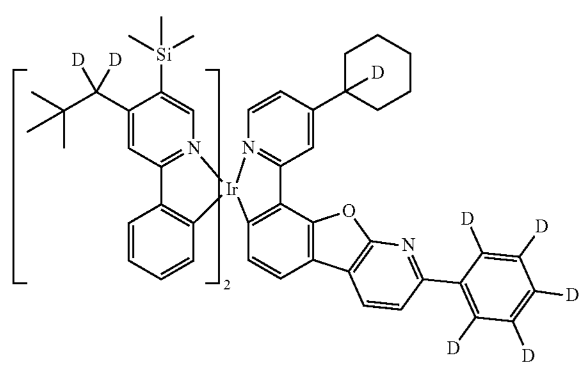

-continued
536
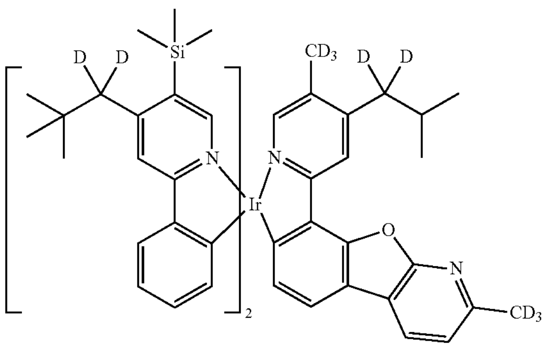
537
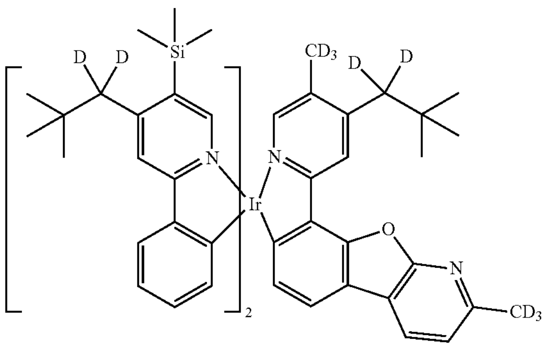
538
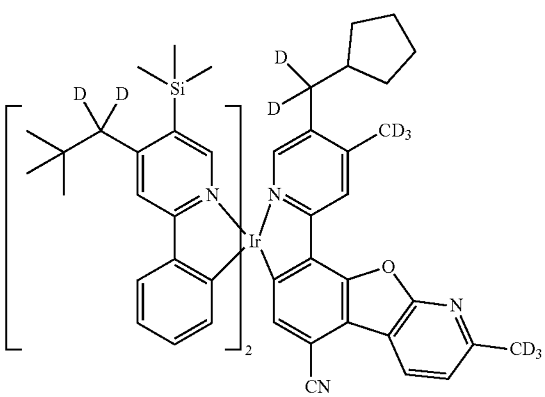
539
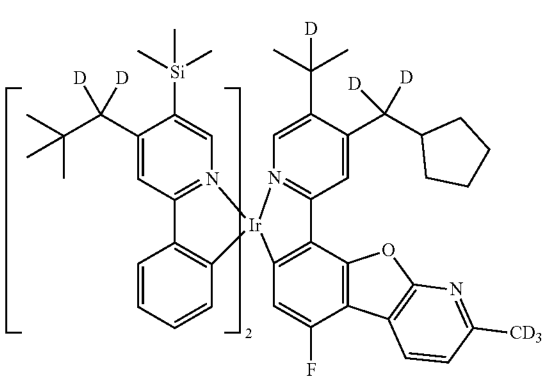
-continued
540
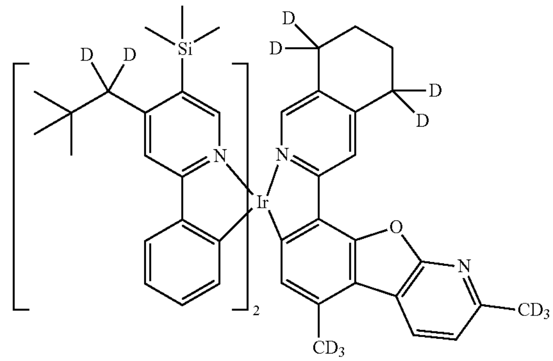
541
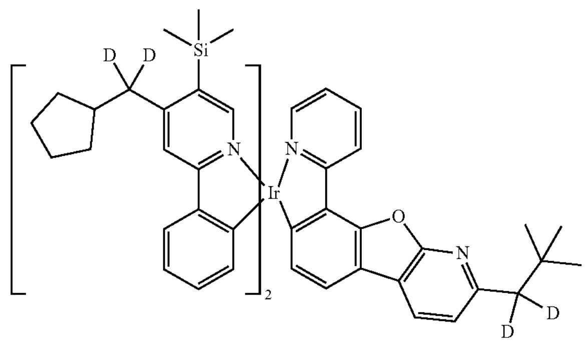
542
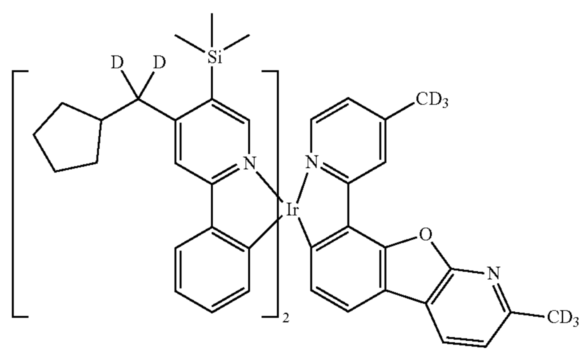
543
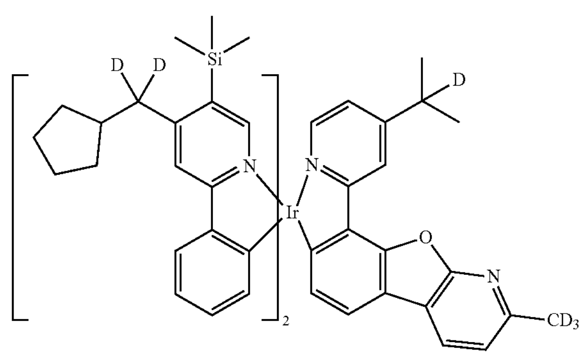

-continued
544
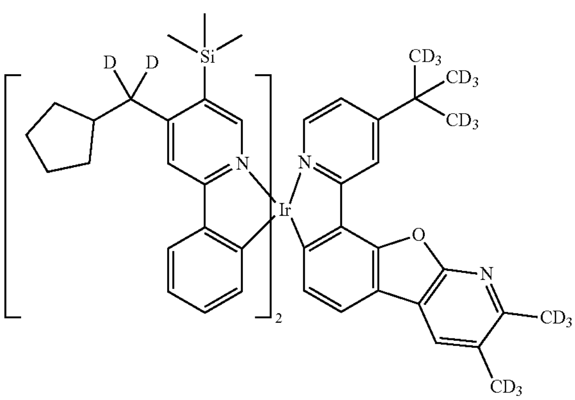
545
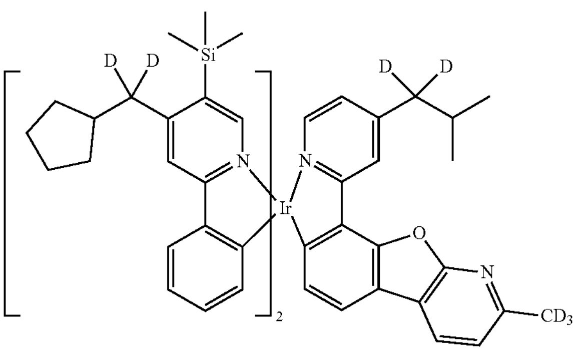
546
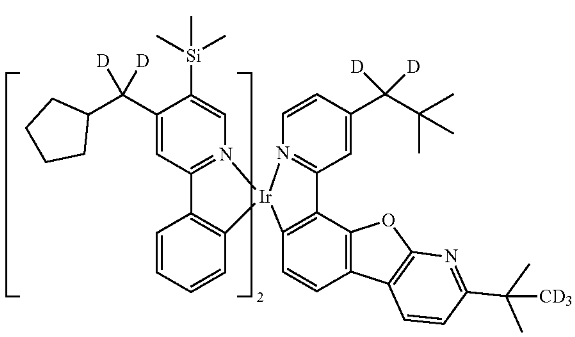
547
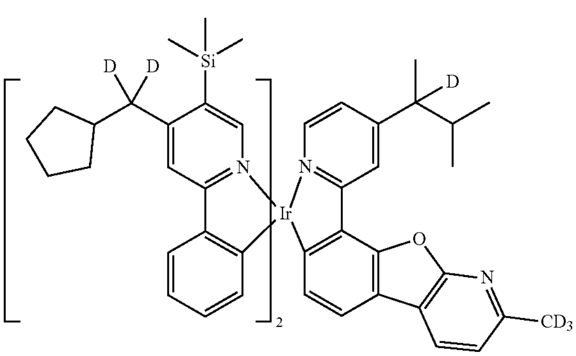
548
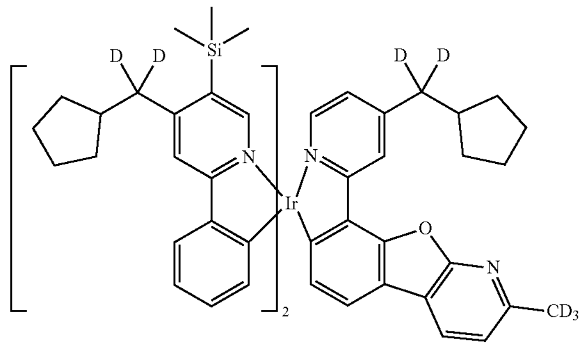
549
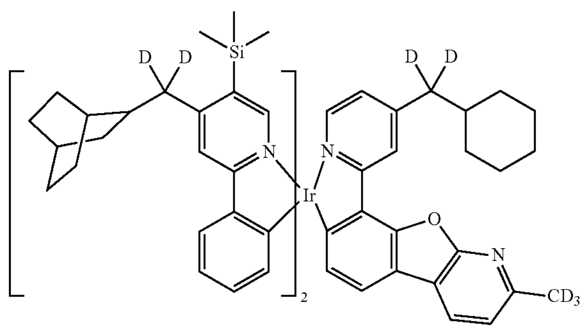
550
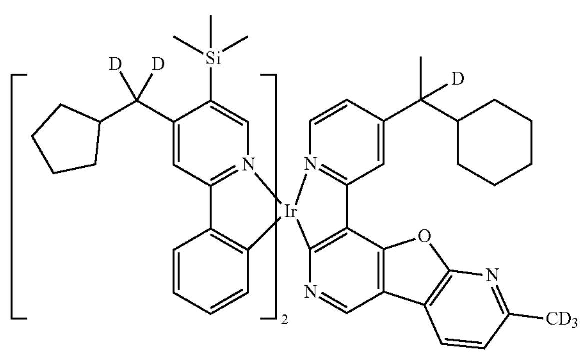
551
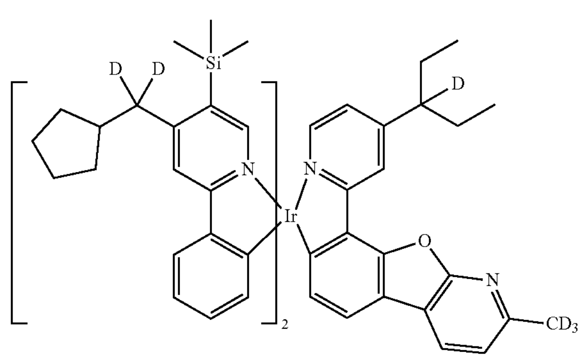

-continued
552
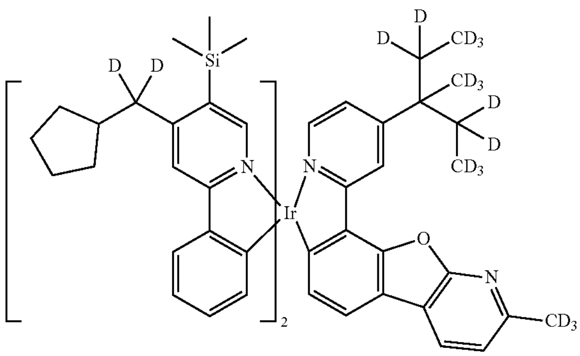
553
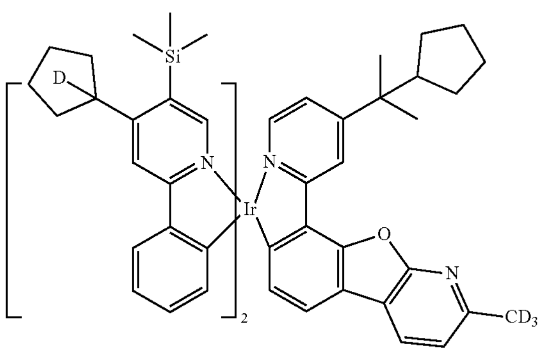
554
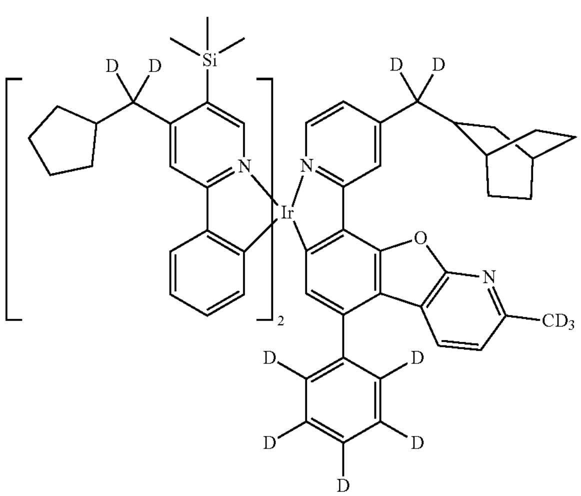
555
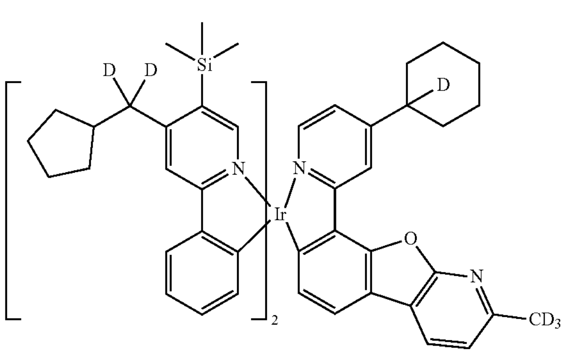
-continued
556
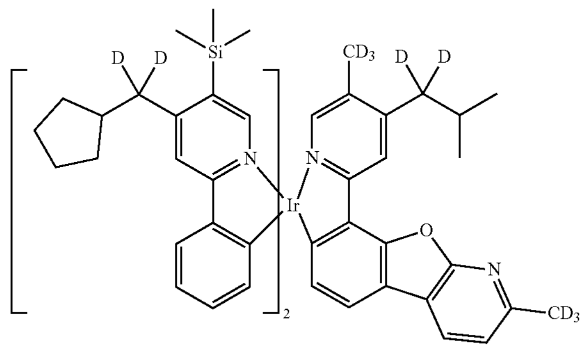
557
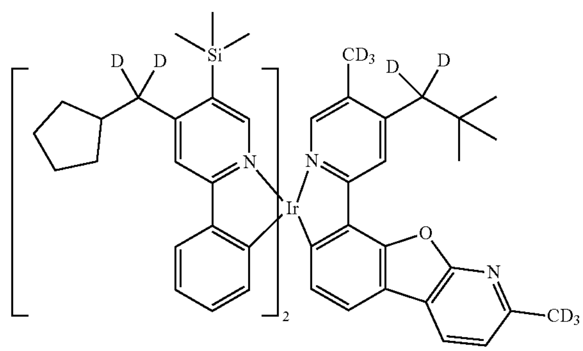
558
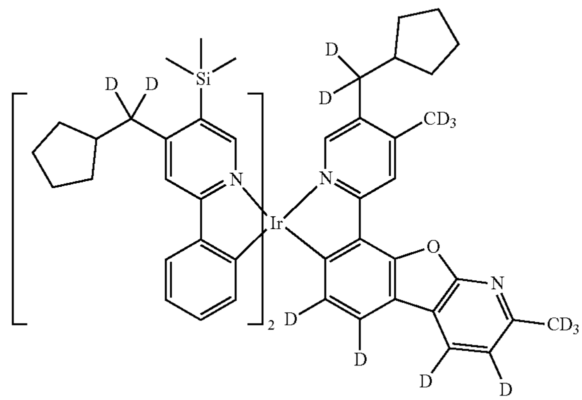
559
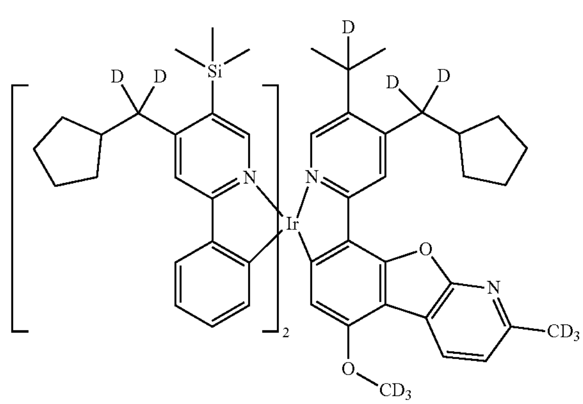

-continued
560
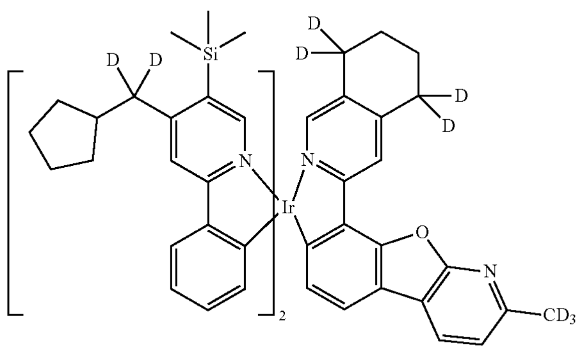
561
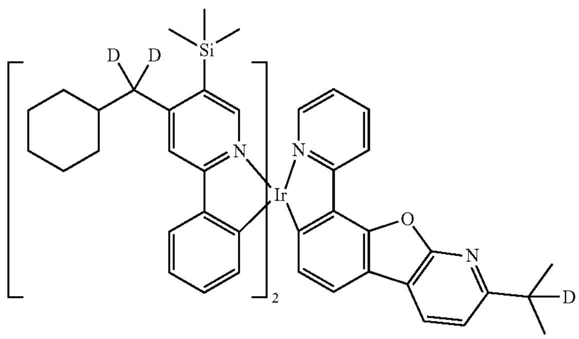
562
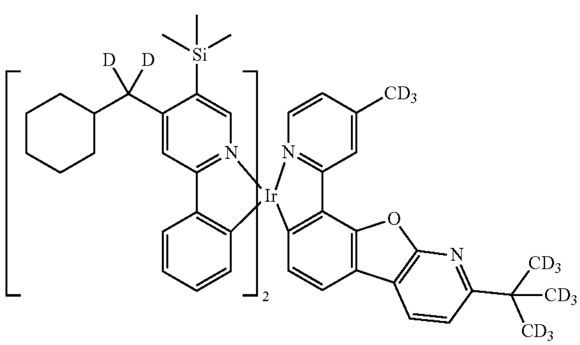
563
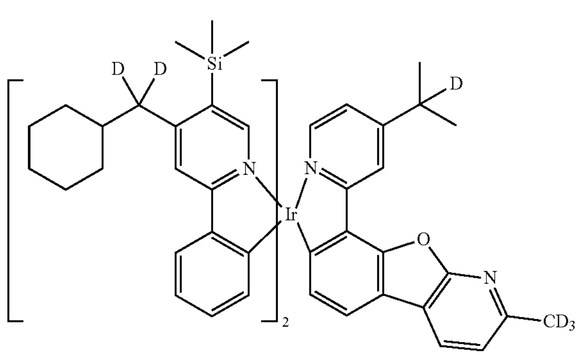
-continued
564
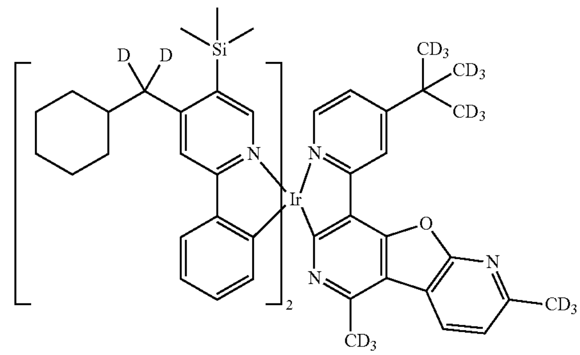
565
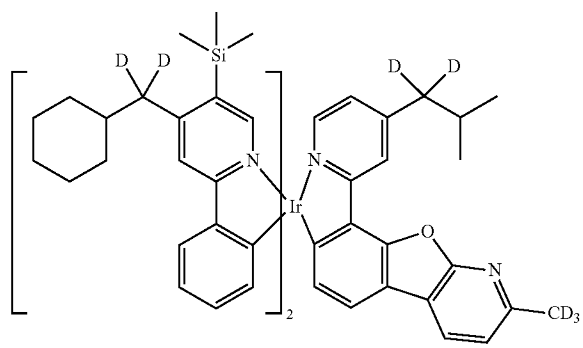
566
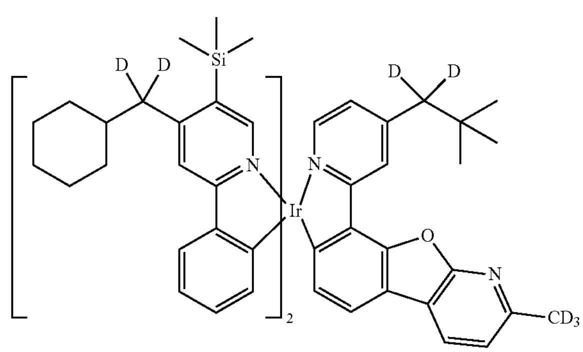
567
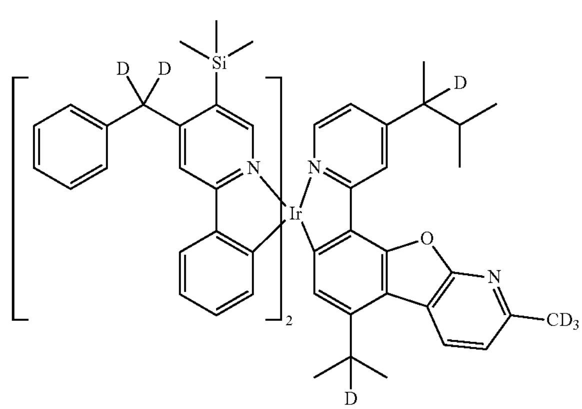

-continued
568
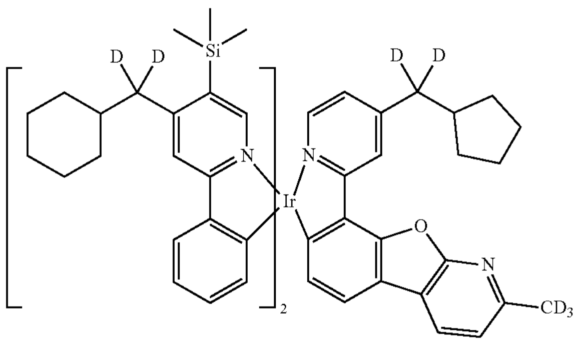
569
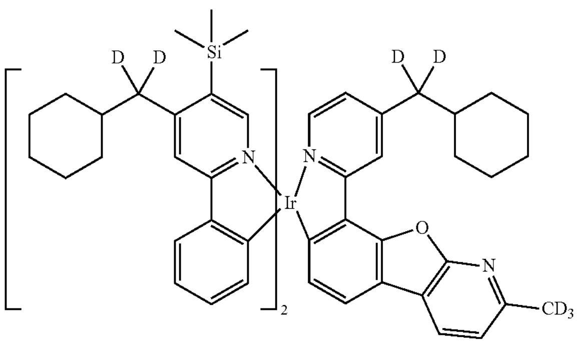
570
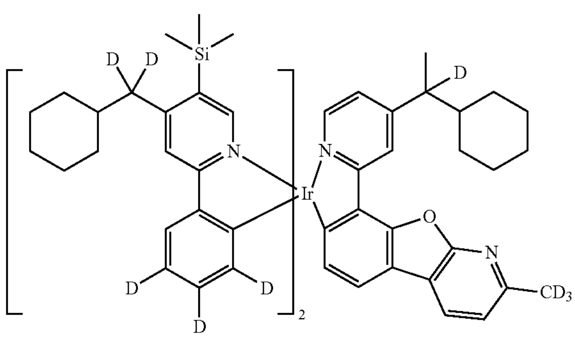
571
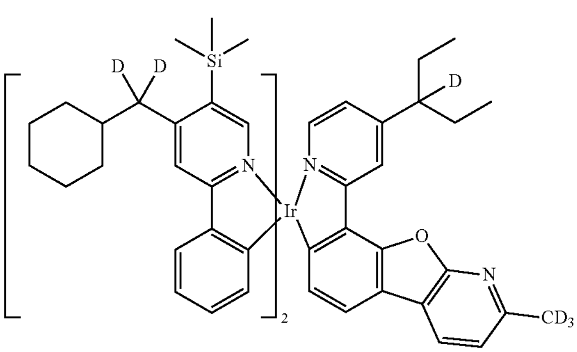
-continued
572
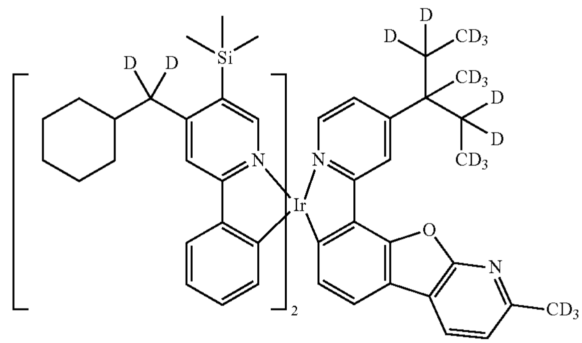
573
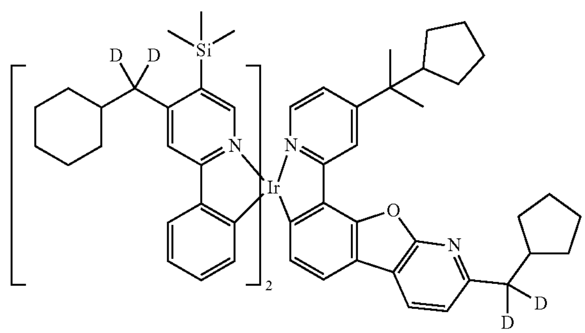
574
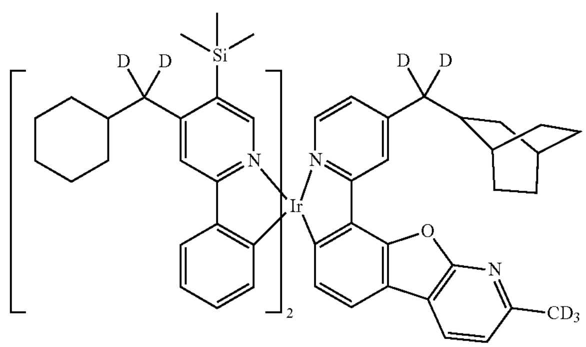
575
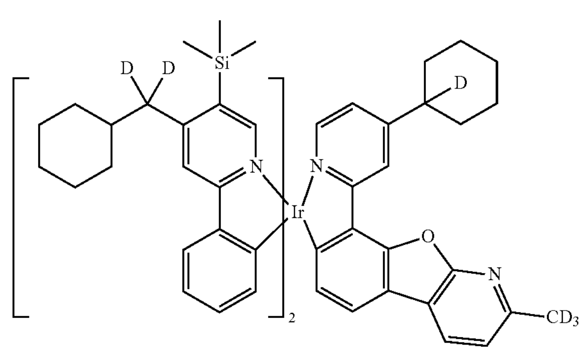

-continued
576
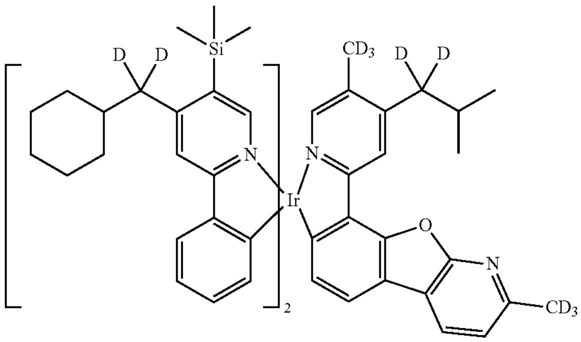
577
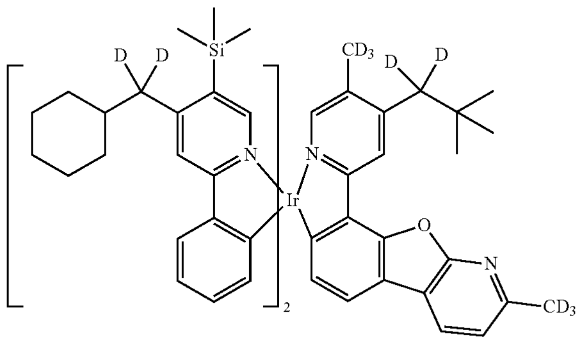
578
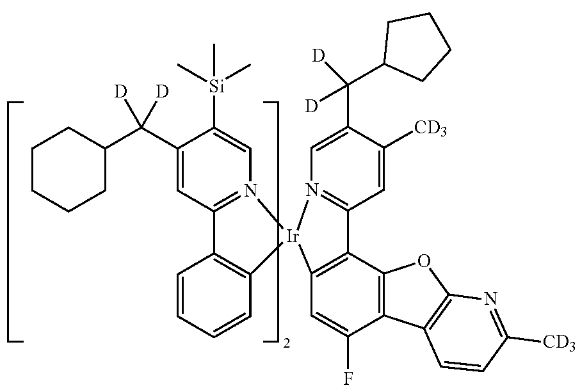
579
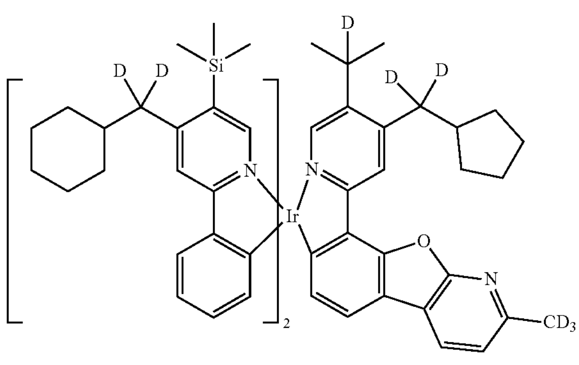
-continued
580
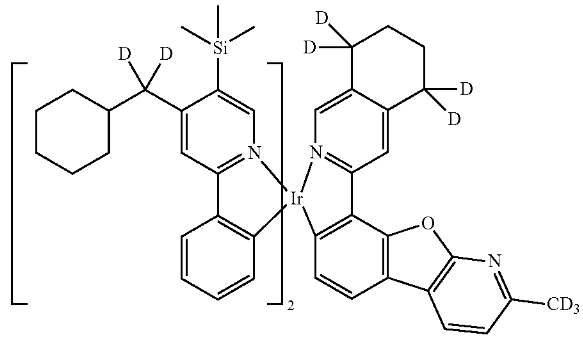
581
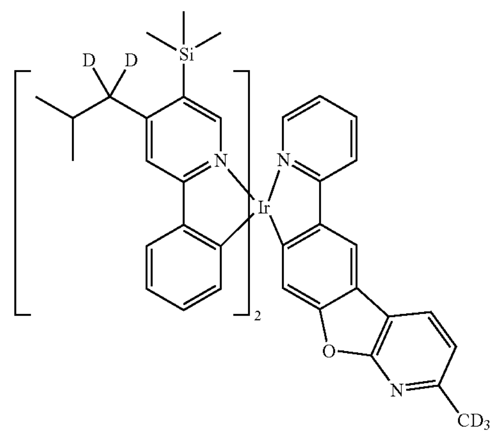
582
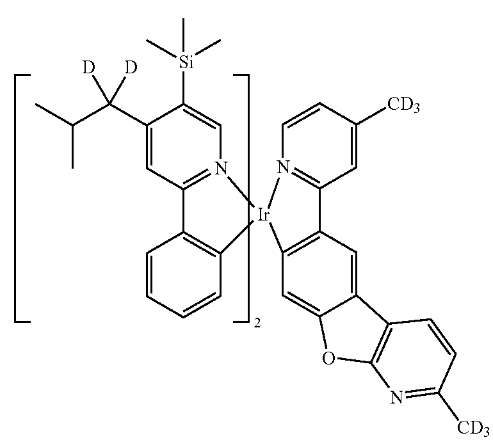

-continued
583
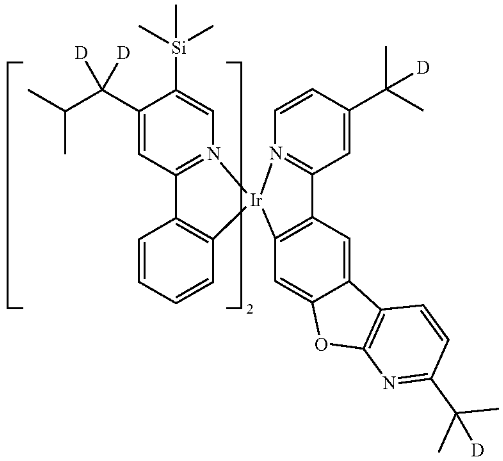
584
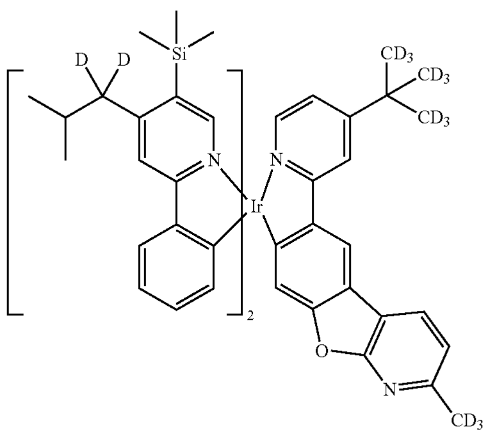
585
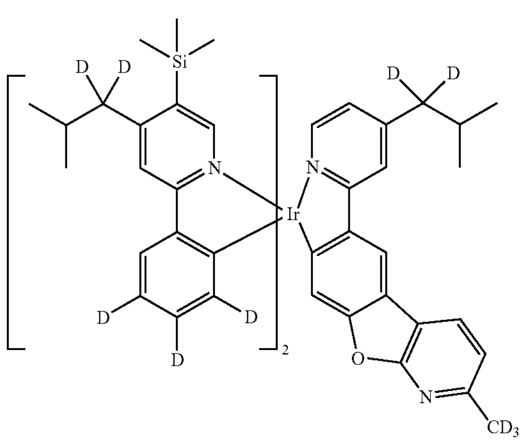
-continued
586
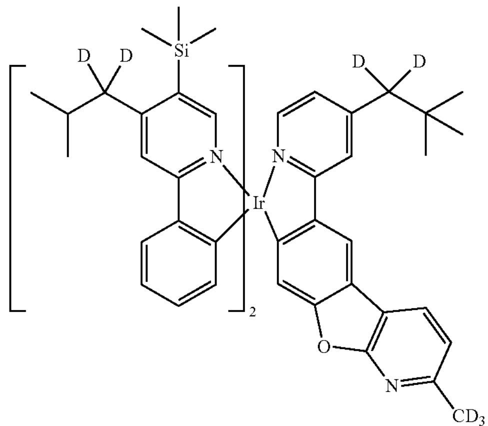
587
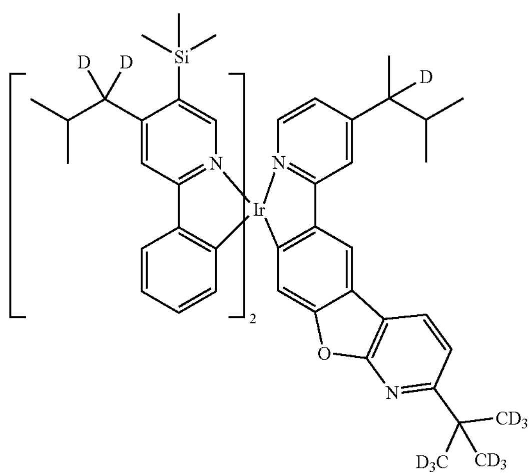
588
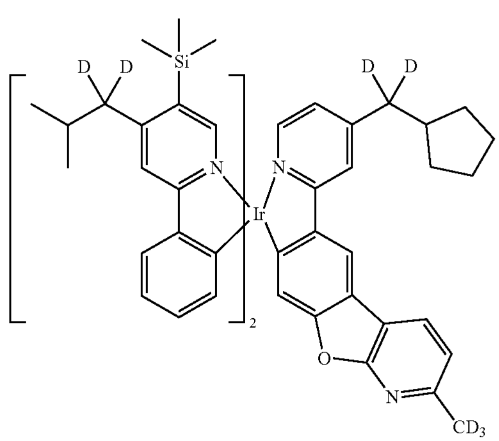

589
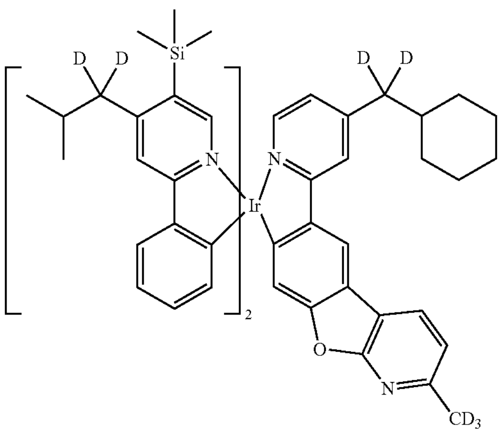
590
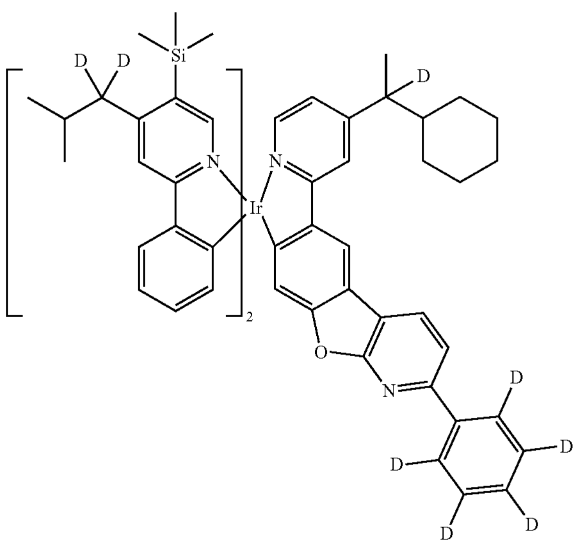
591
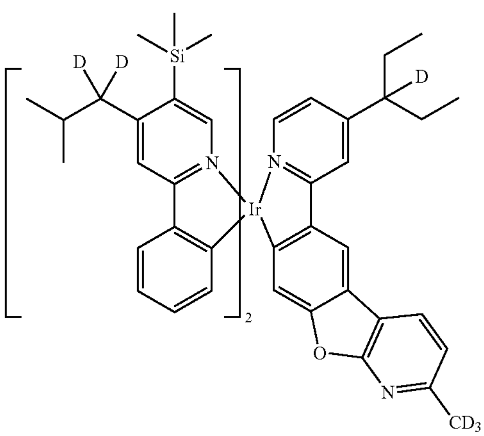
592
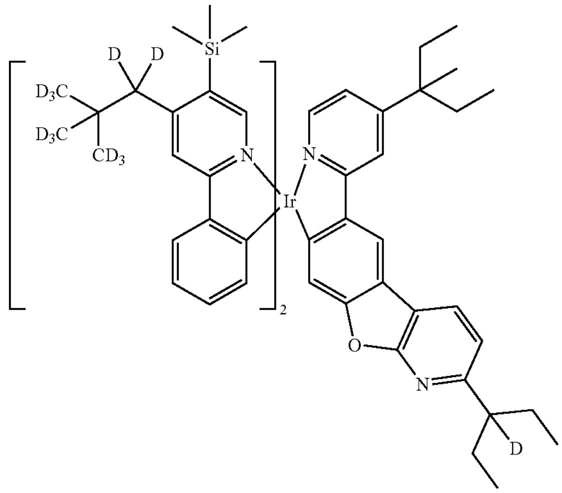
593
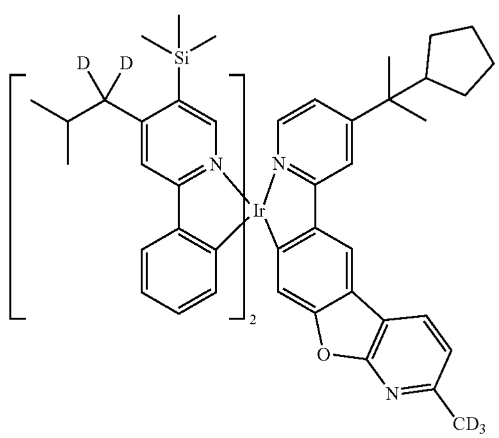
594
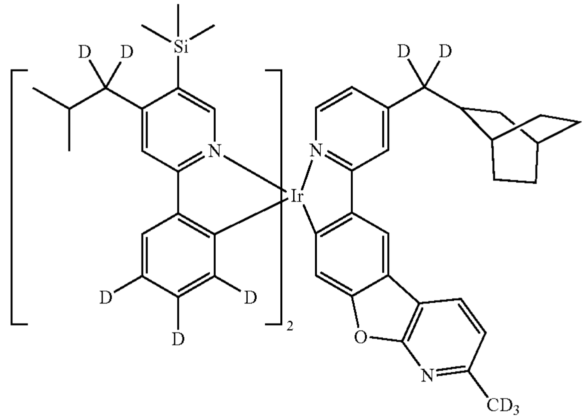

595
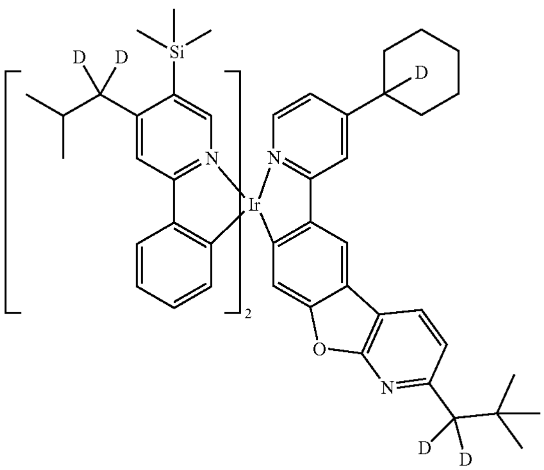
596
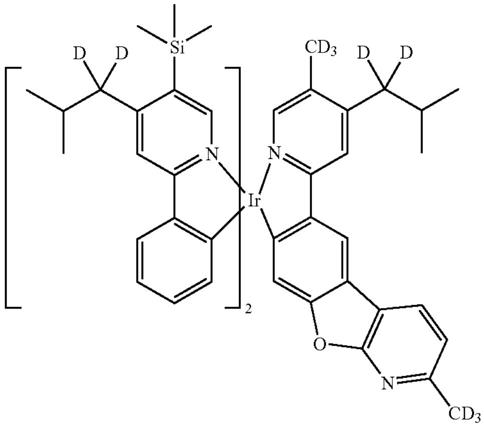
597
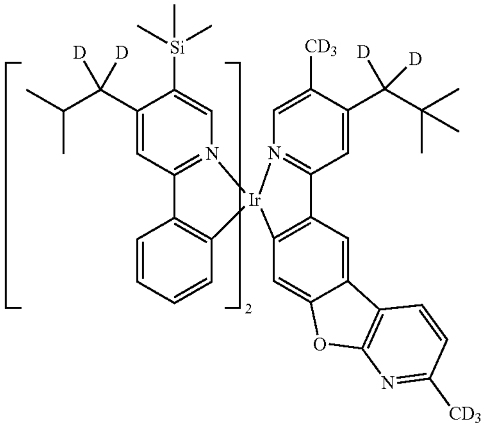
598
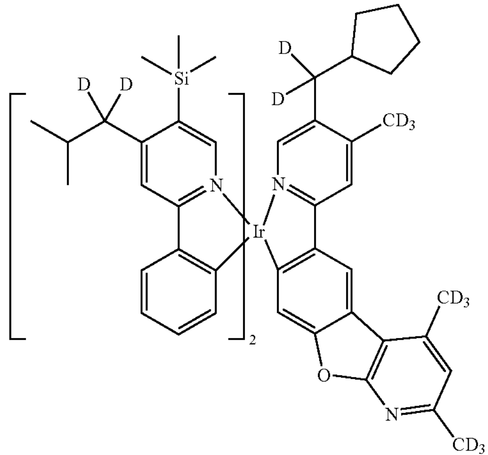
599
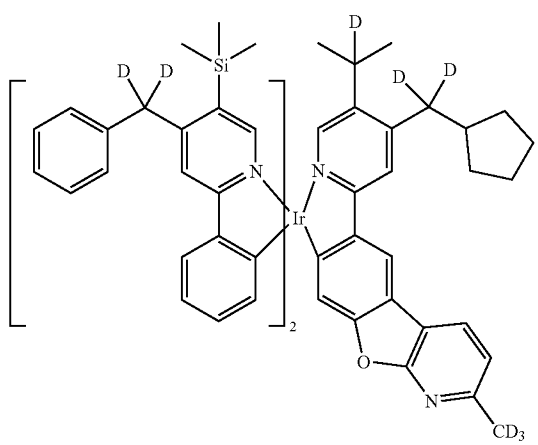
600
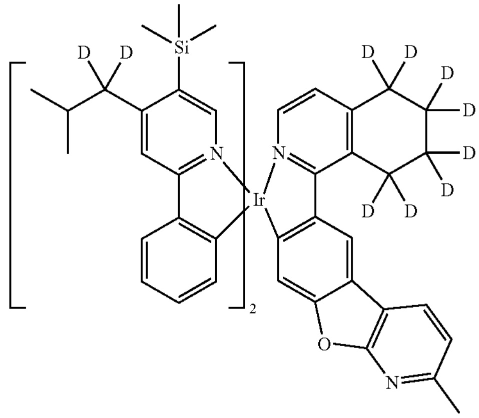

-continued
601
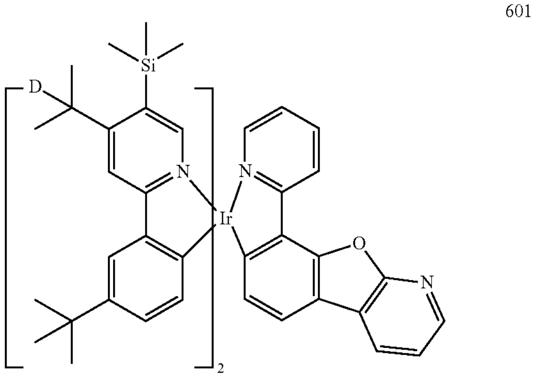
602
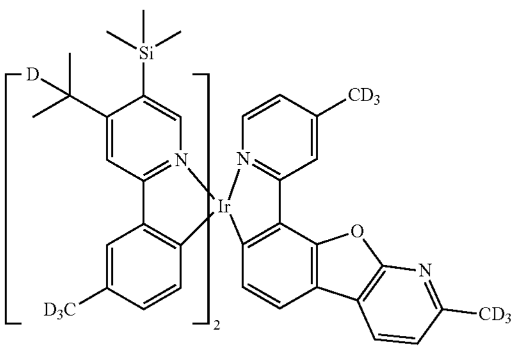
603
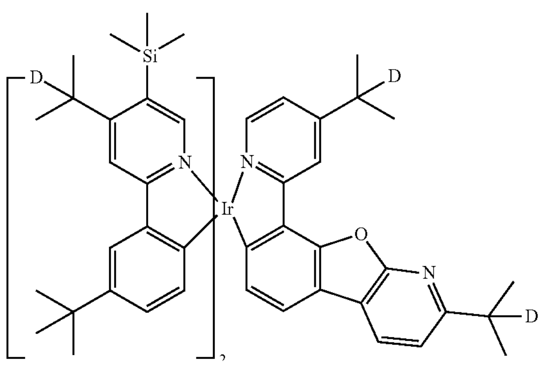
604
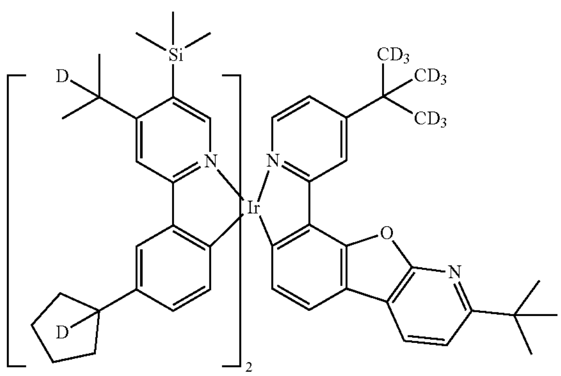
-continued
605
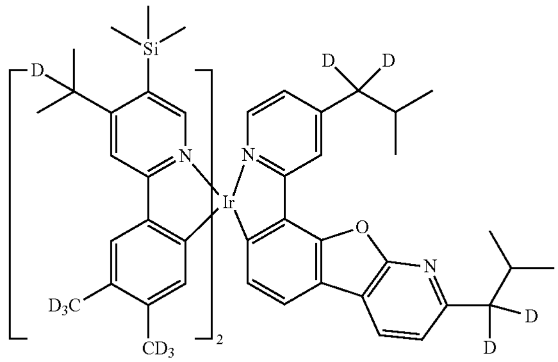
606
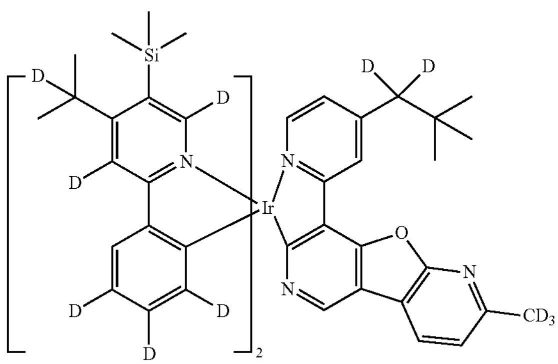
607
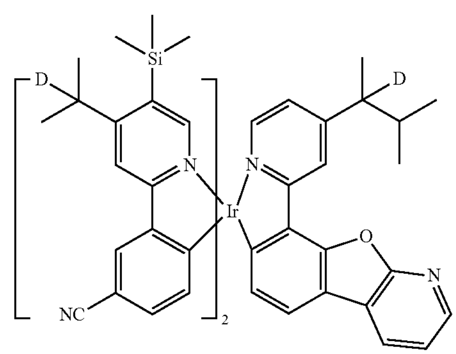
608
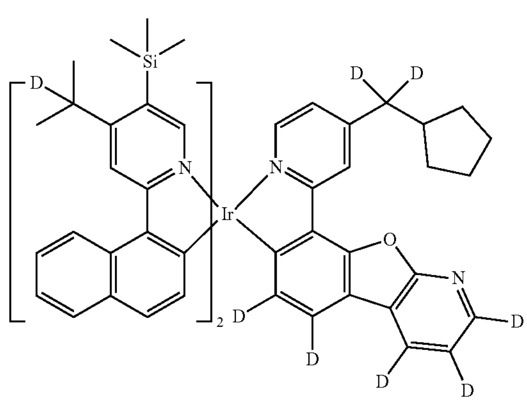

609
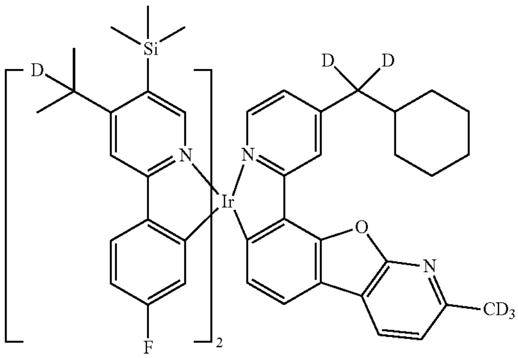
610
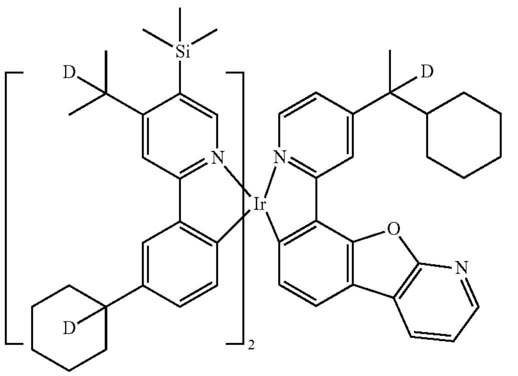
611
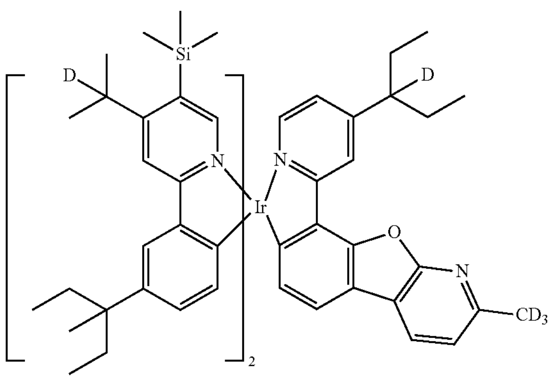
612
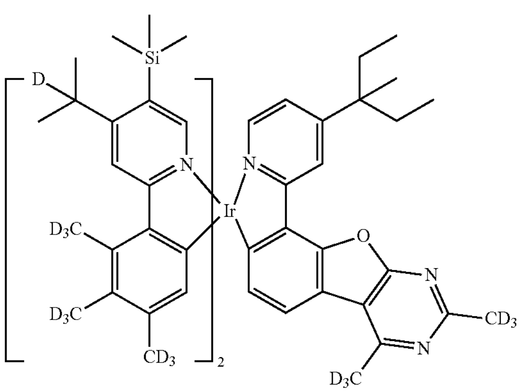
613
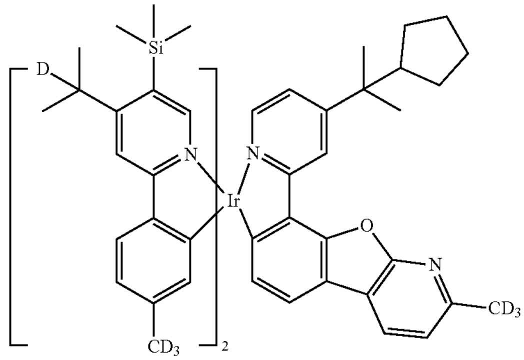
614
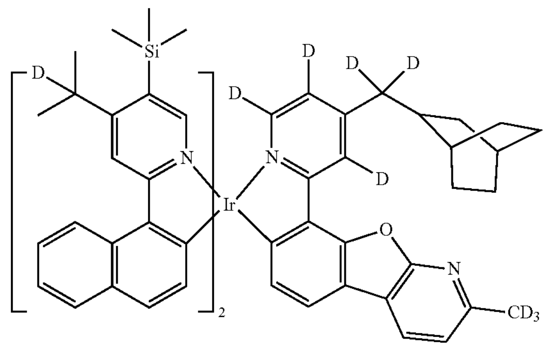
615
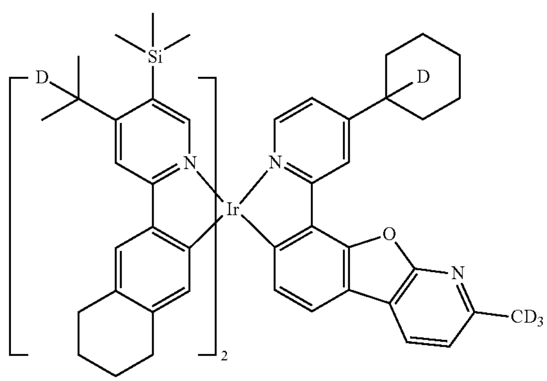
616
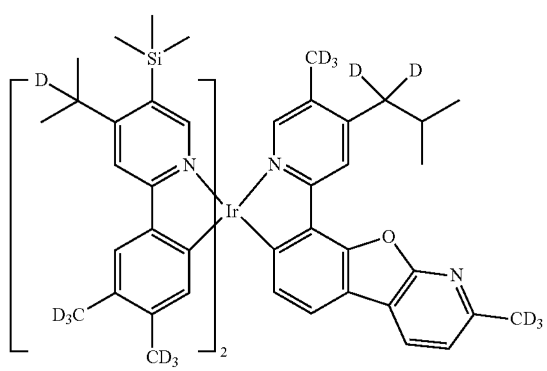

-continued
617
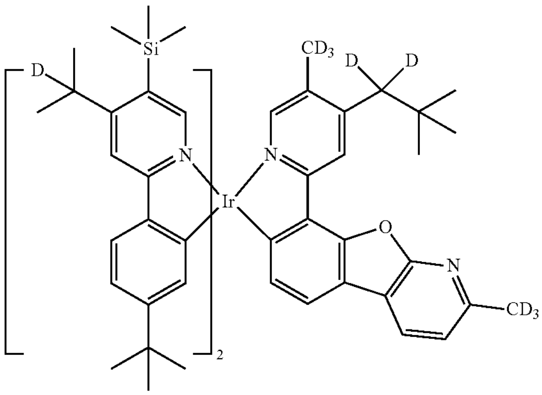
618
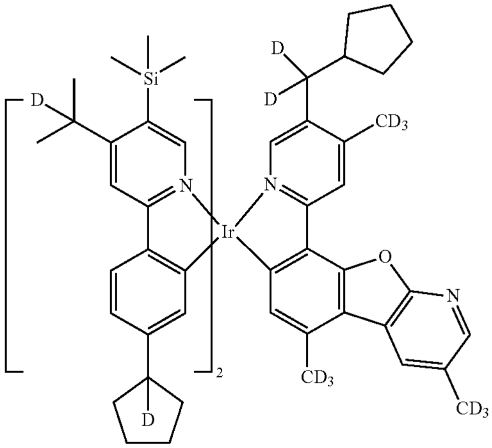
619
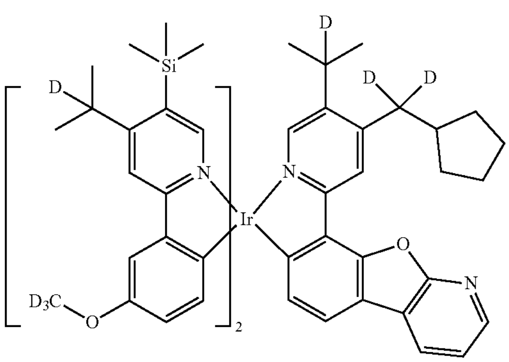
620
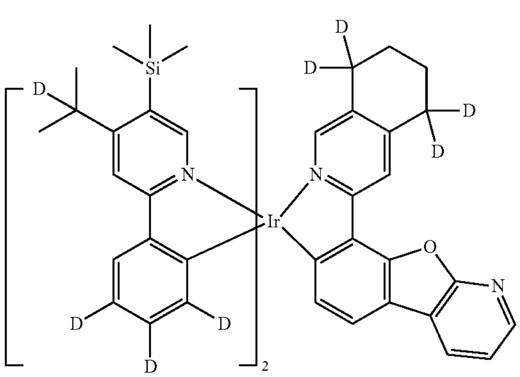
-continued
621
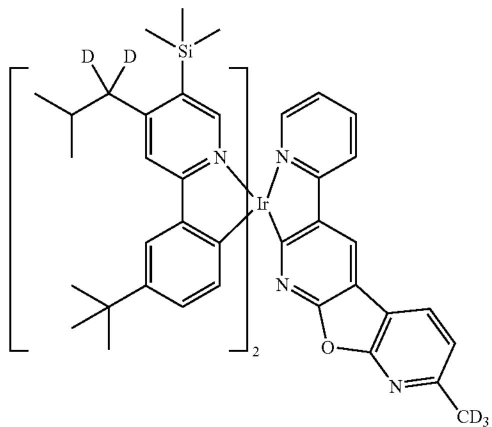
622
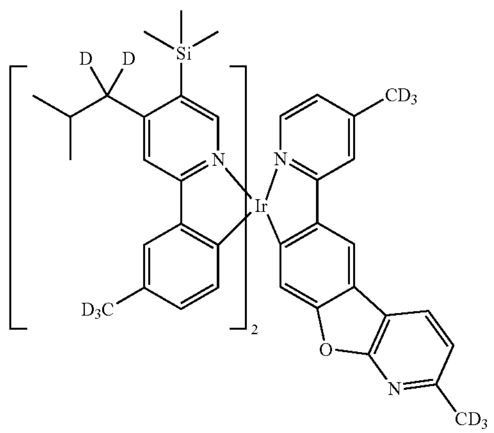
623
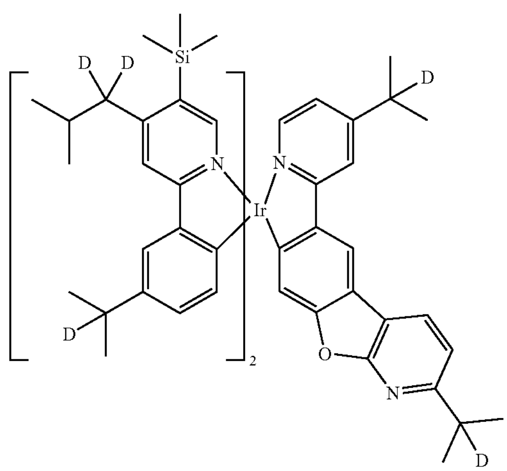

-continued
624
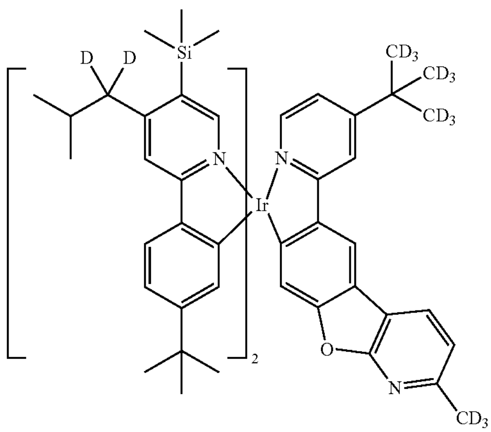
625
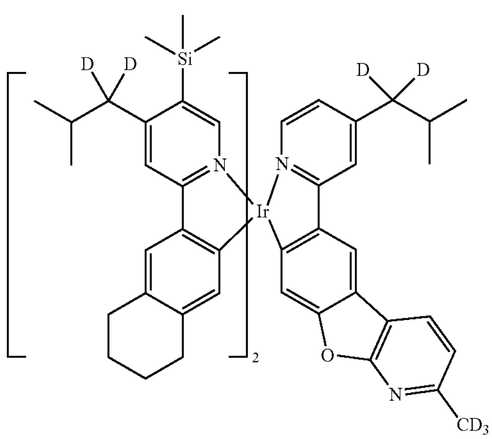
626
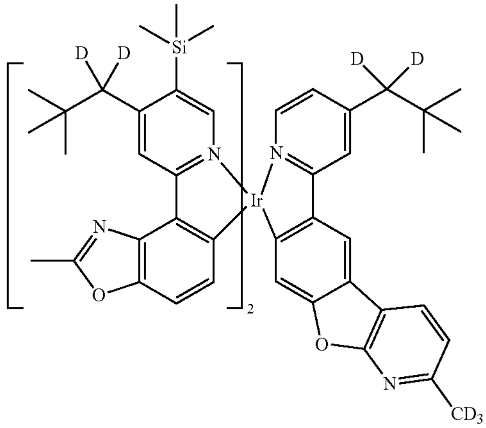
-continued
627
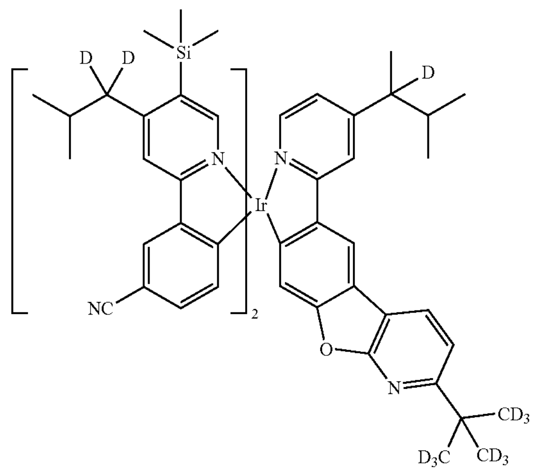
628
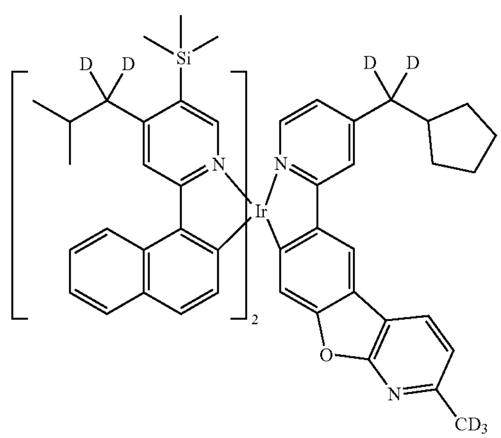
629
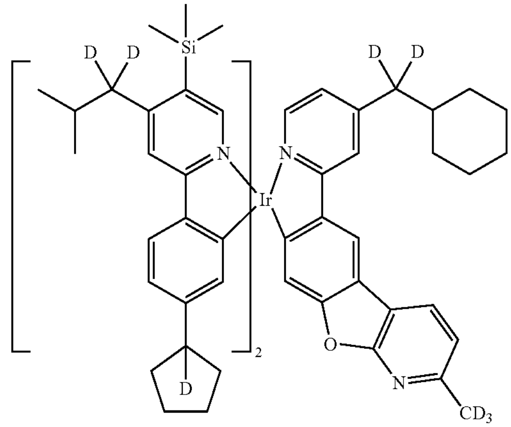

630
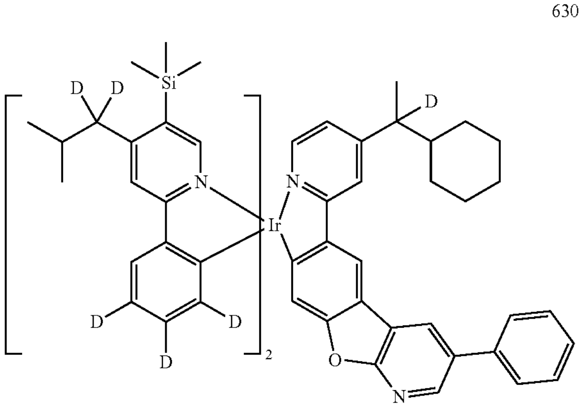
631
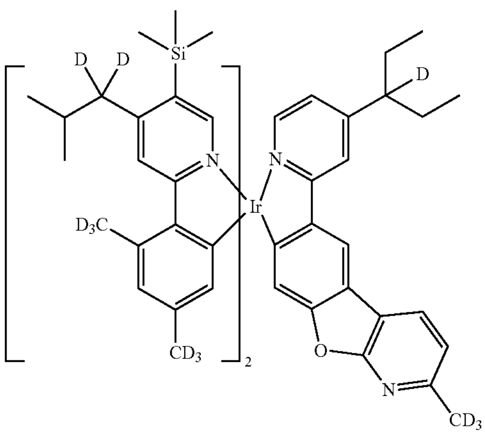
632
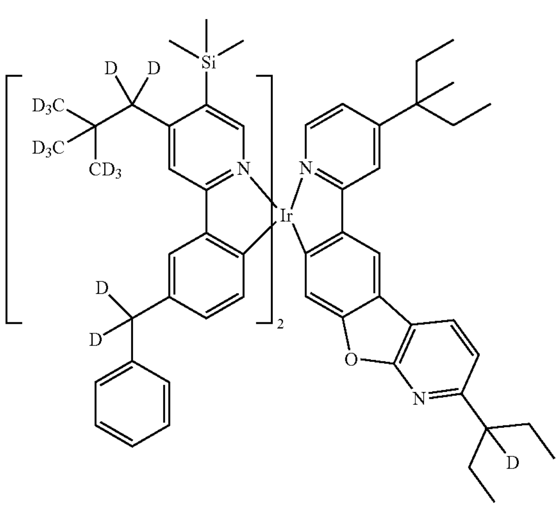
633
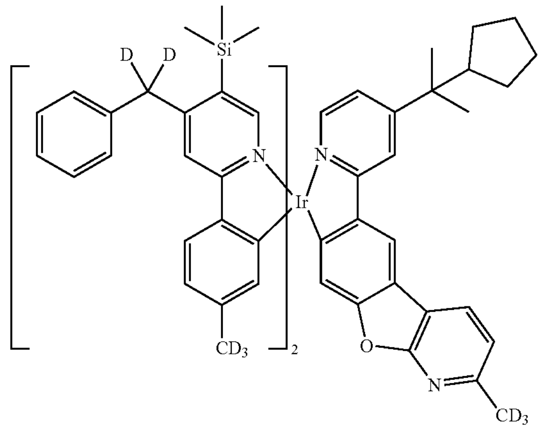
634
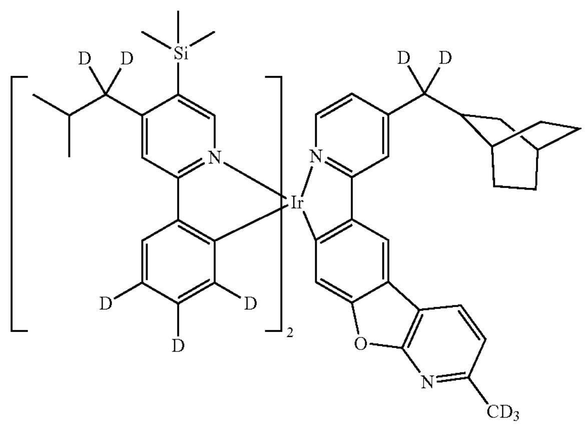
635
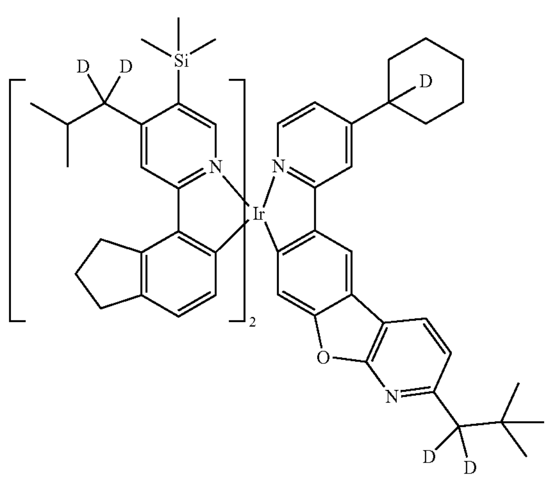

-continued
636
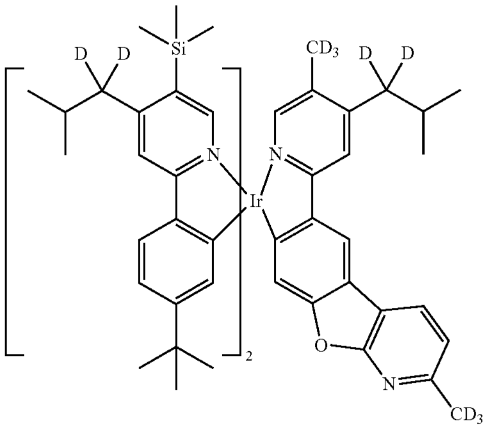
637
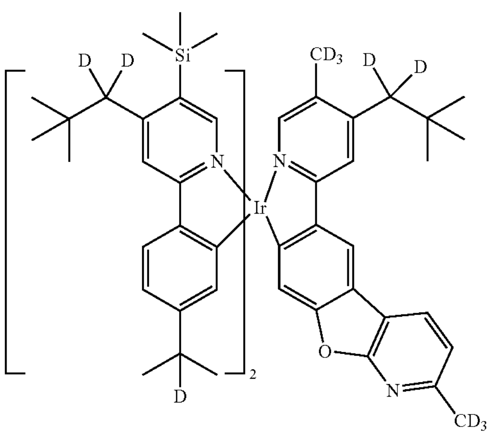
638
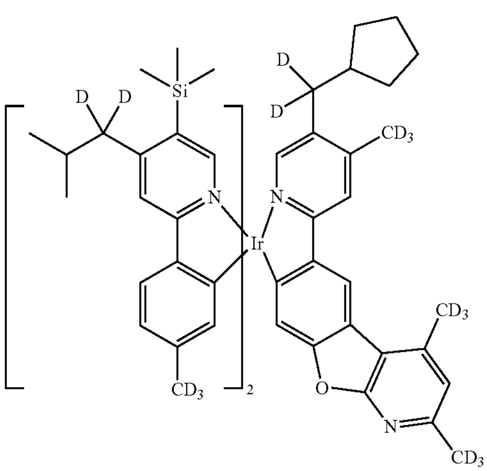
-continued
639
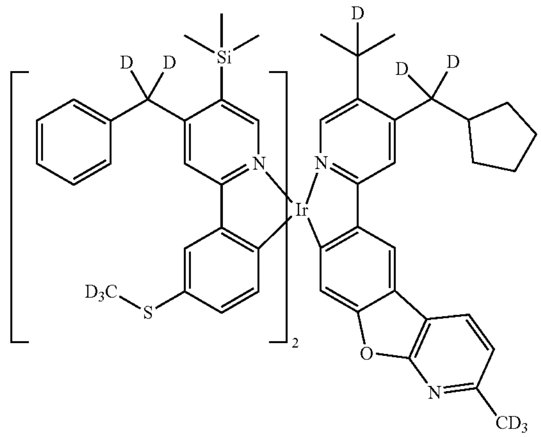
640
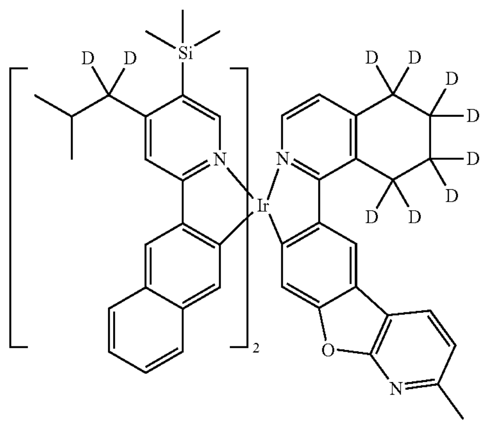
641
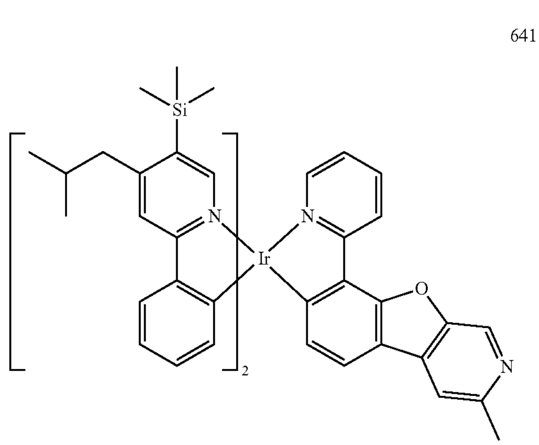

642
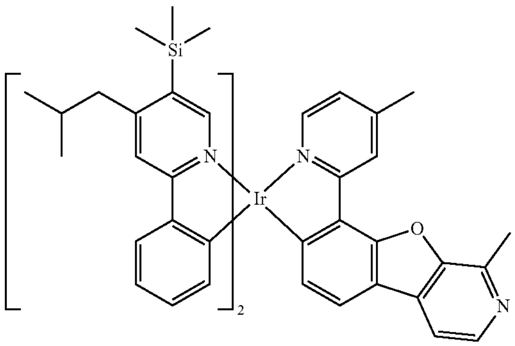
643
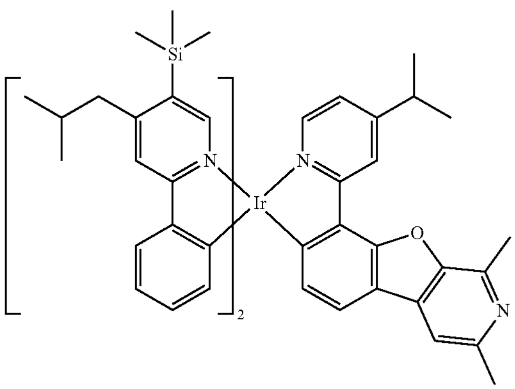
644
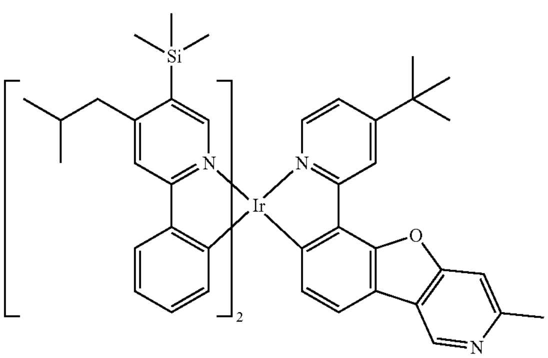
645
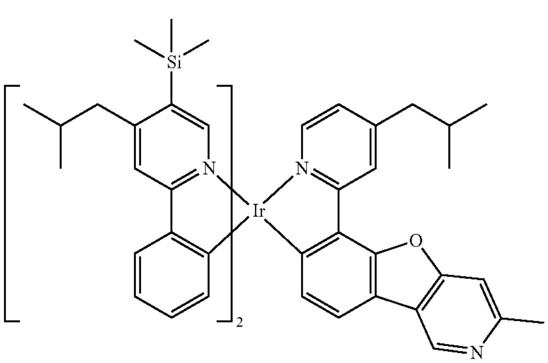
646
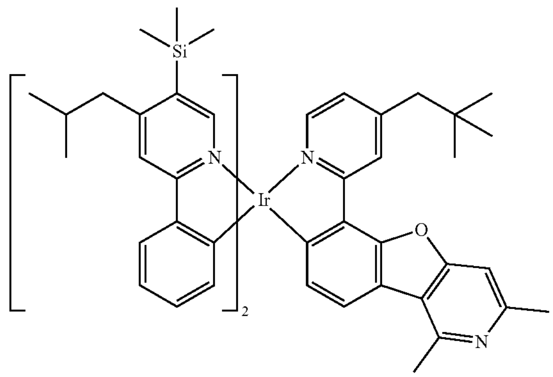
647
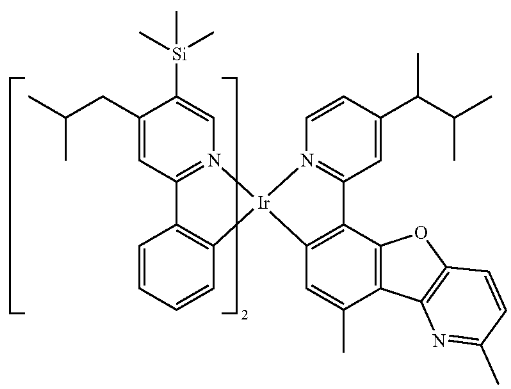
648
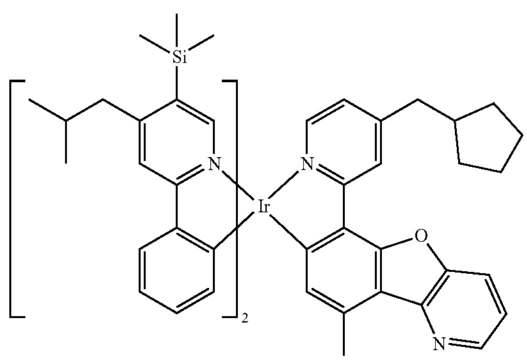
649
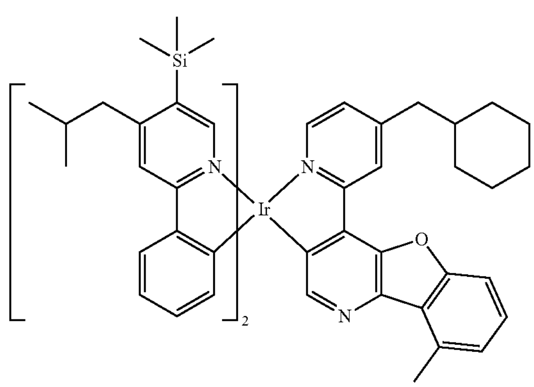

650
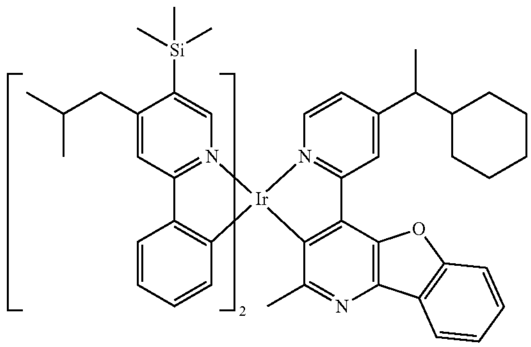
651
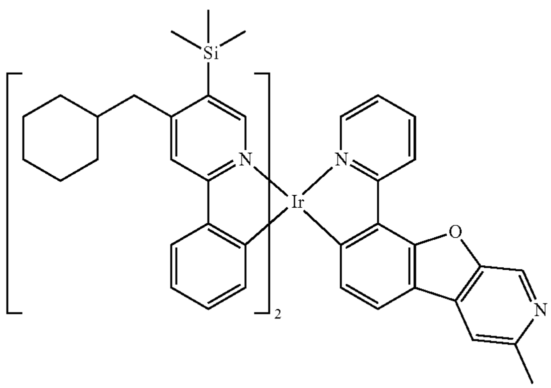
652
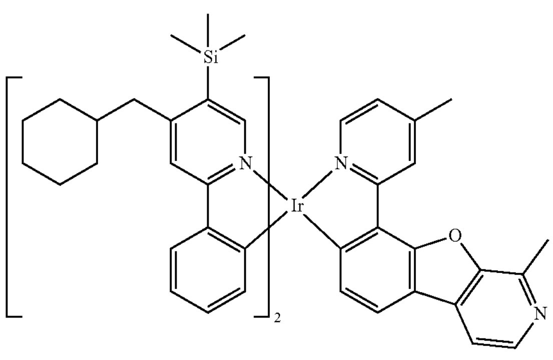
653
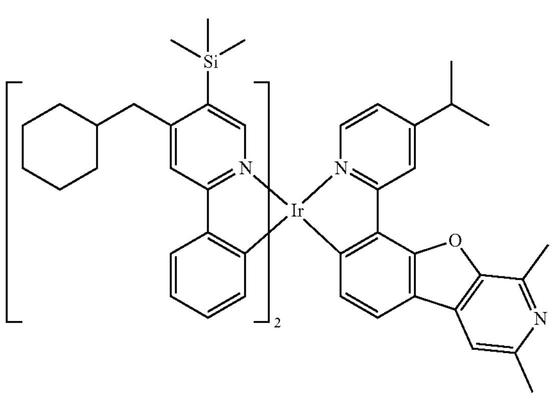
654
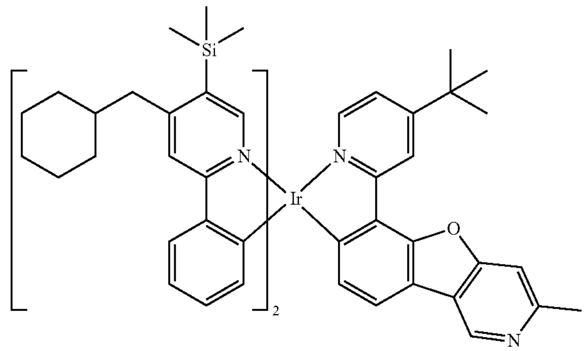
655
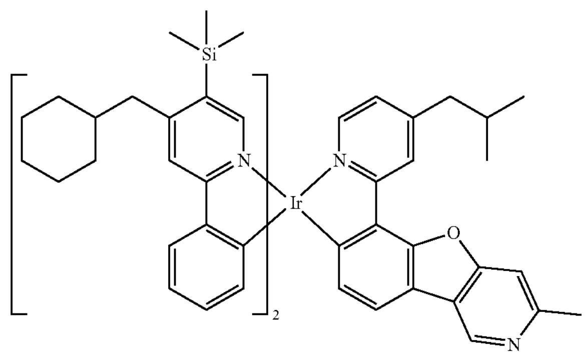
656
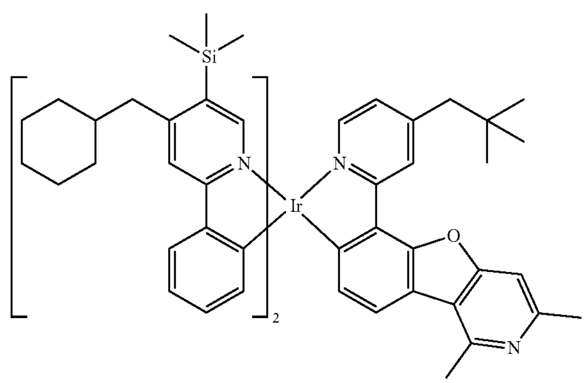
657
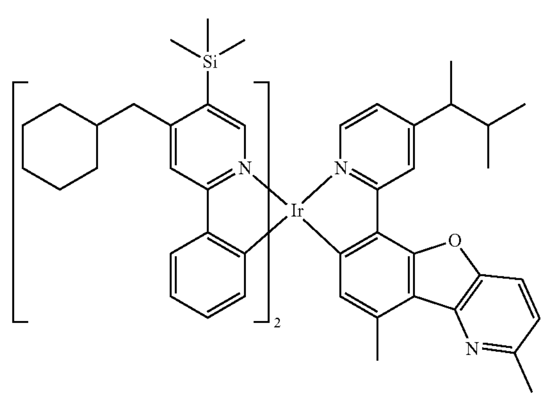

-continued
658
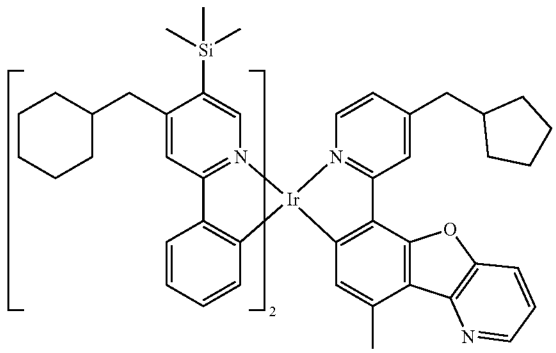
659
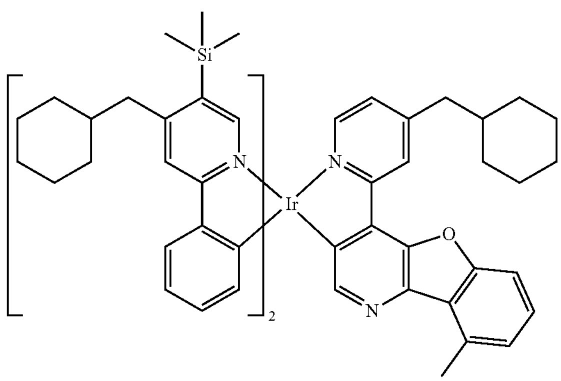
660
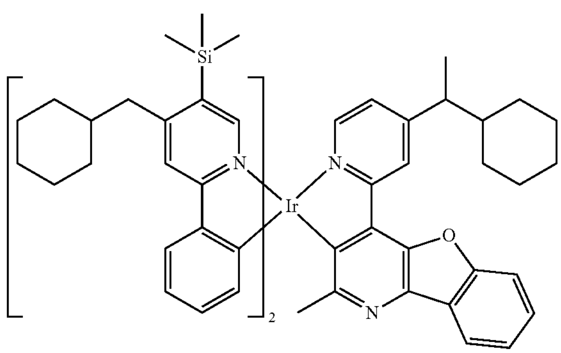
661
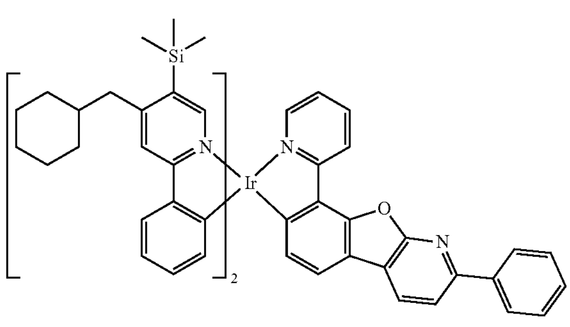
-continued
662
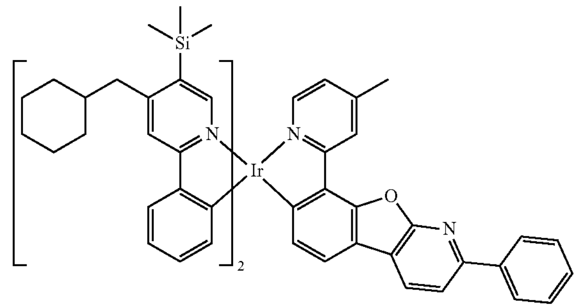
663
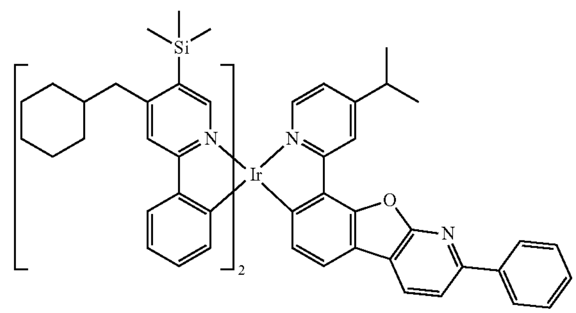
664
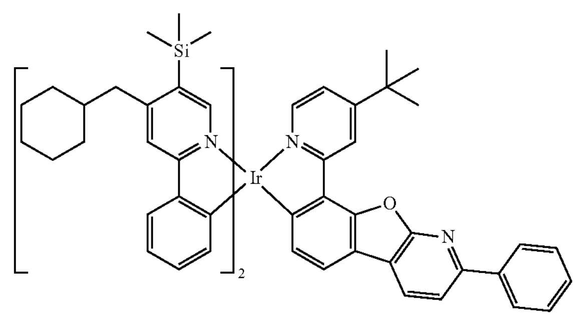
665
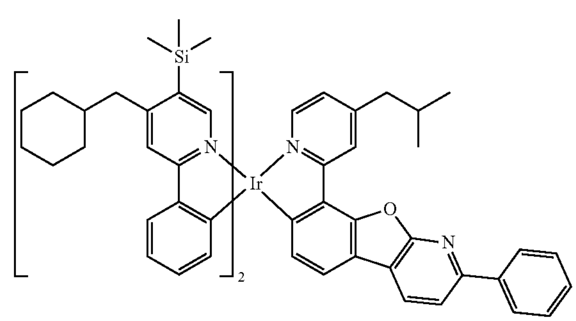

-continued
666
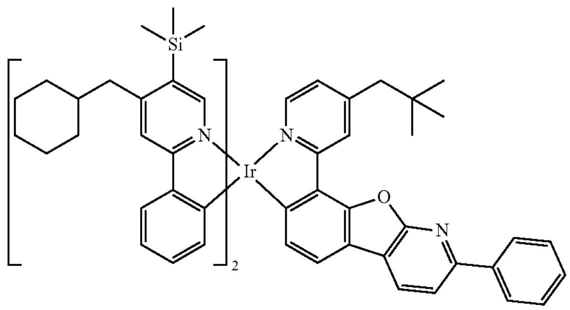
667
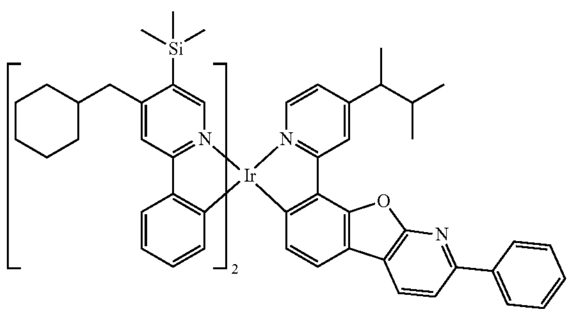
668
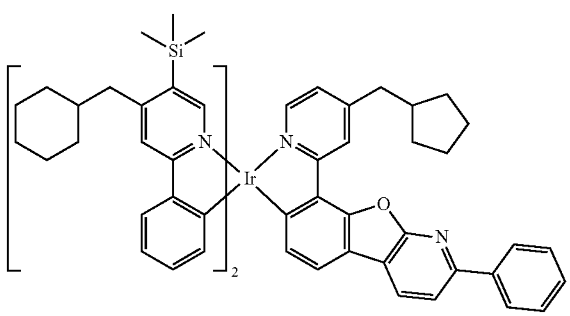
669
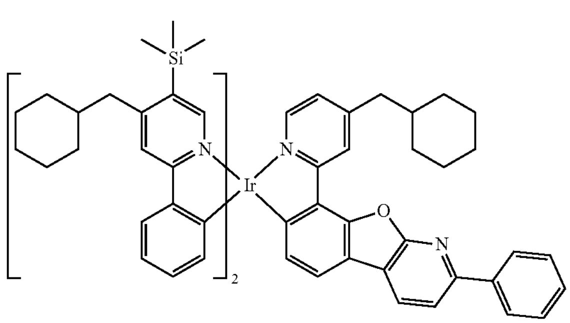
-continued
670
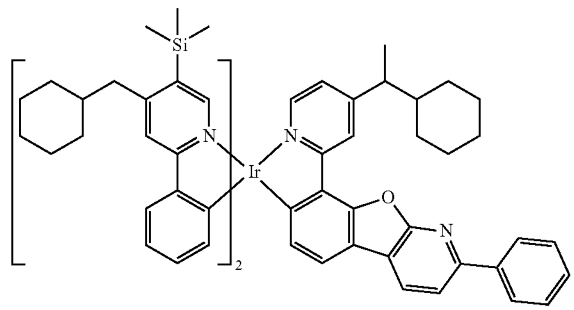
671
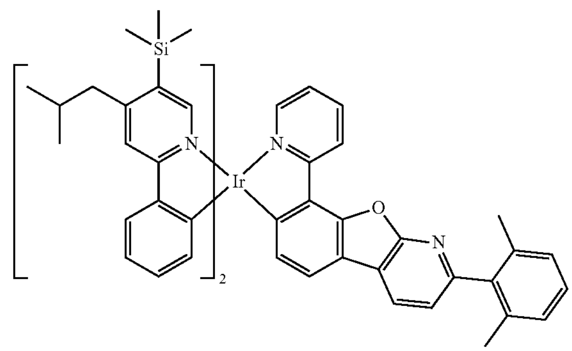
672
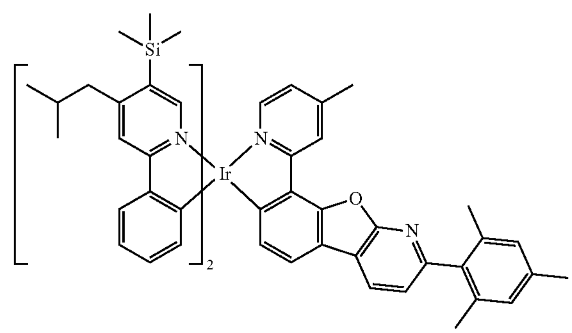
673
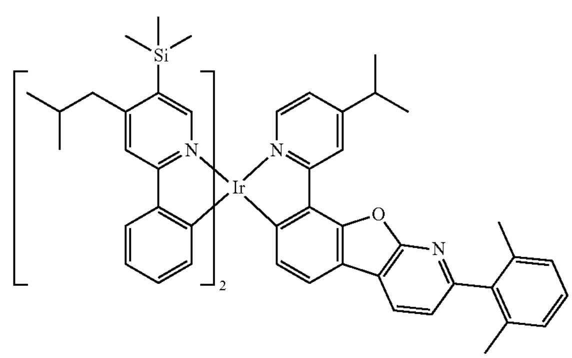

-continued
674
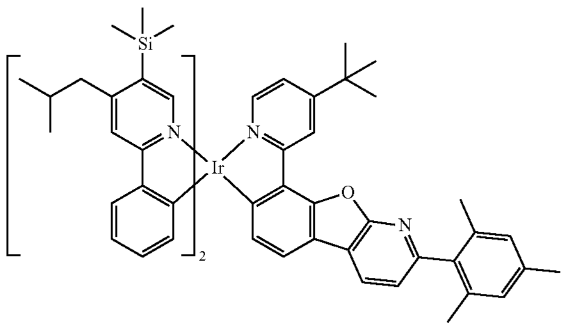
675
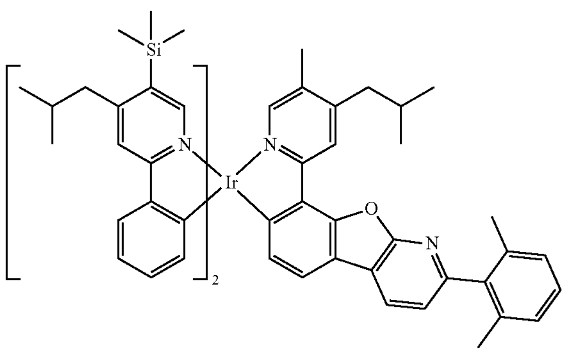
676
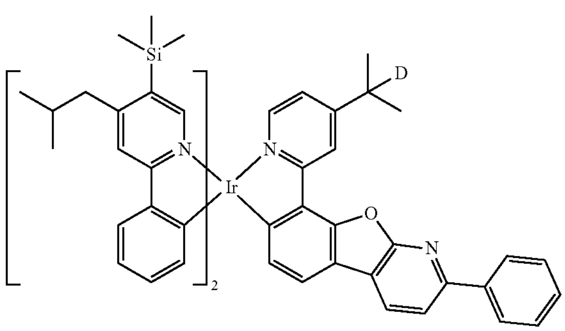
677
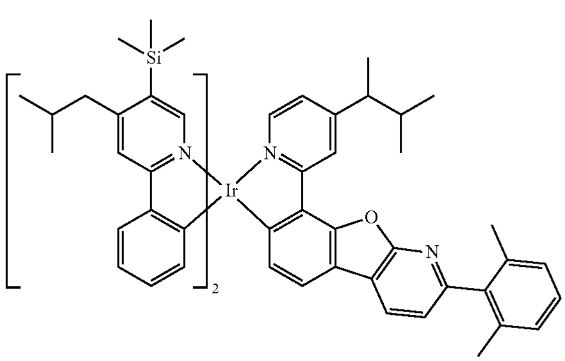
-continued
678
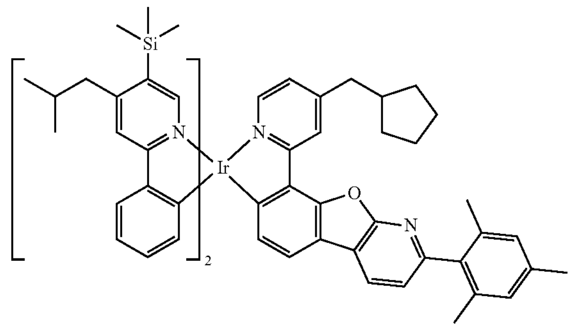
679
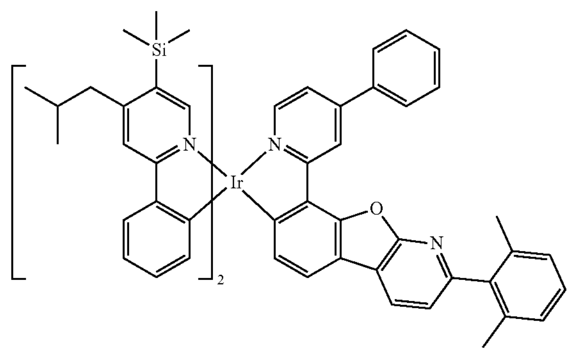
680
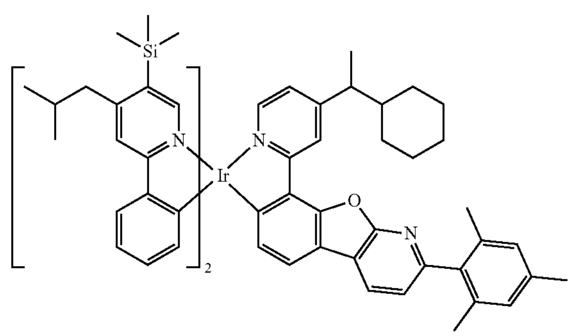
681
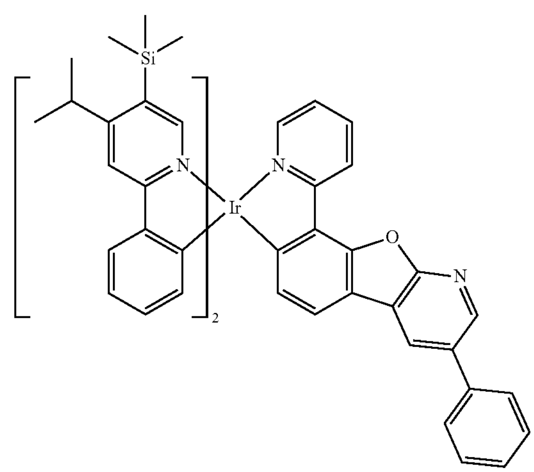

-continued
682
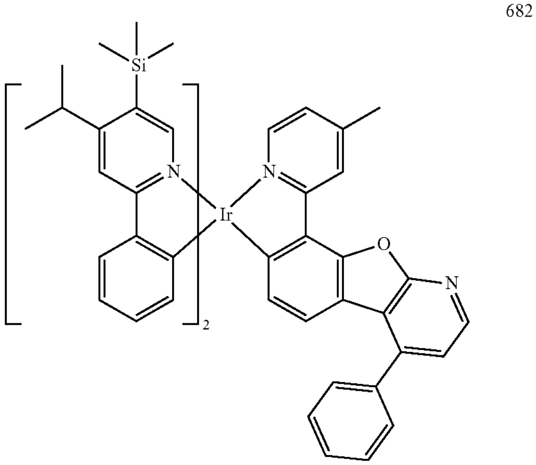
683
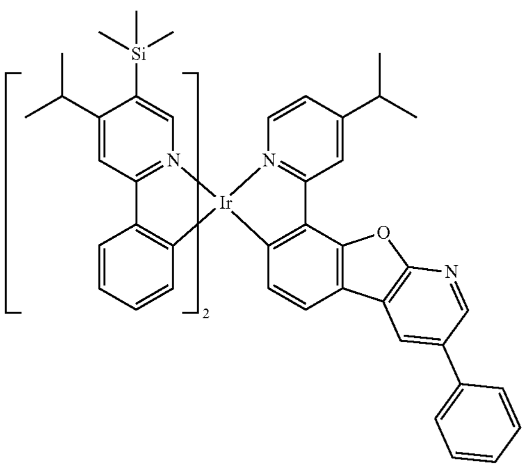
684
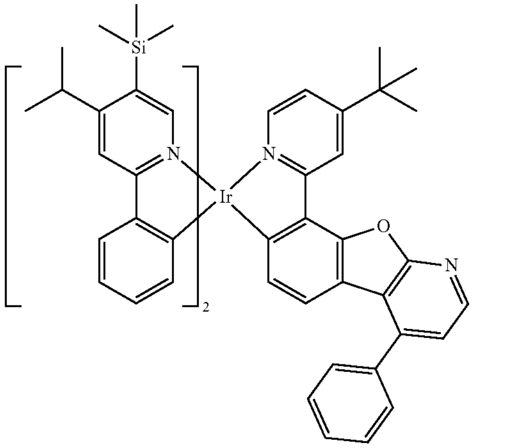
-continued
685
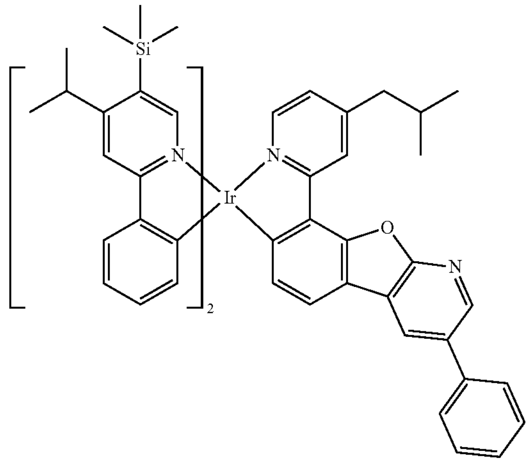
686
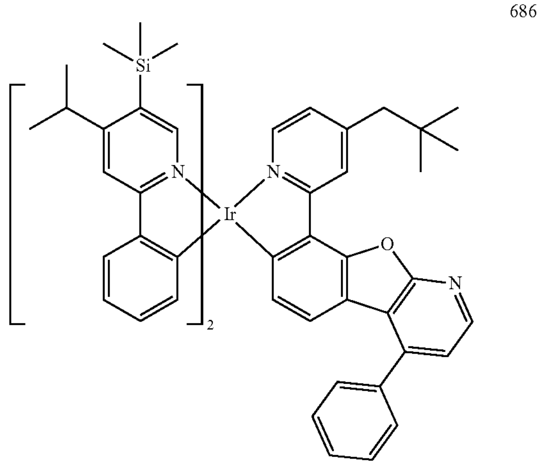
687
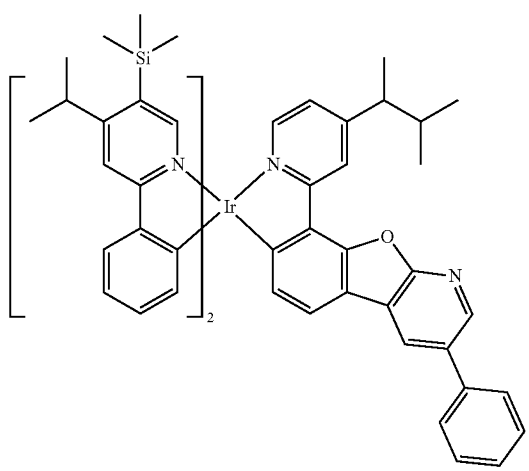

688
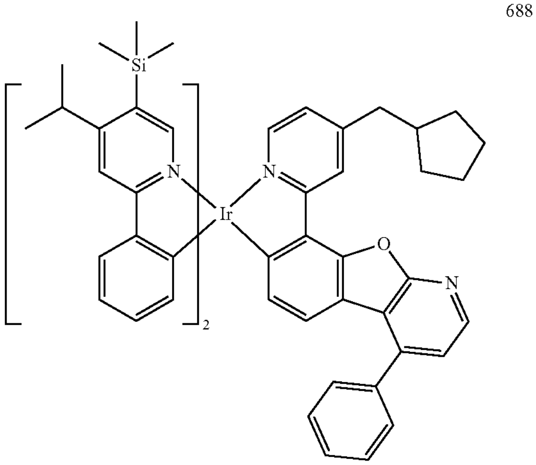
689
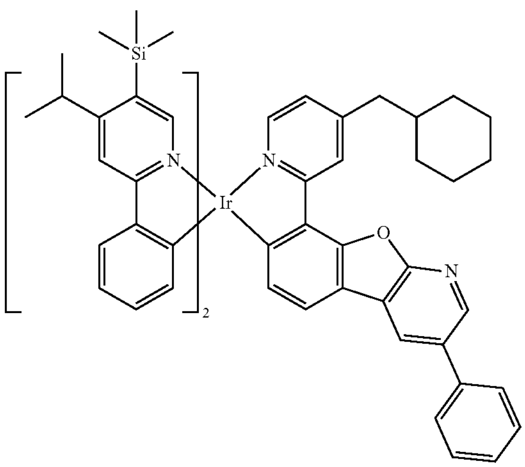
690
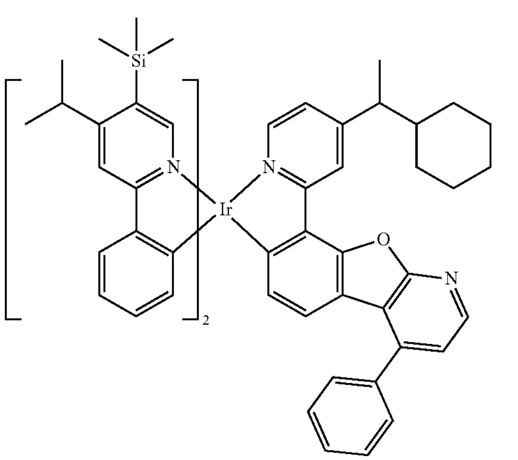
691
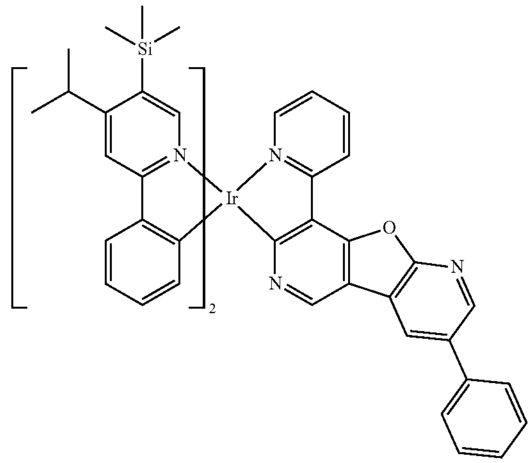
692
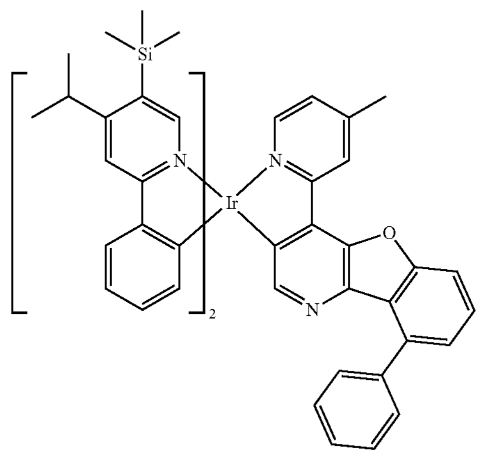
693
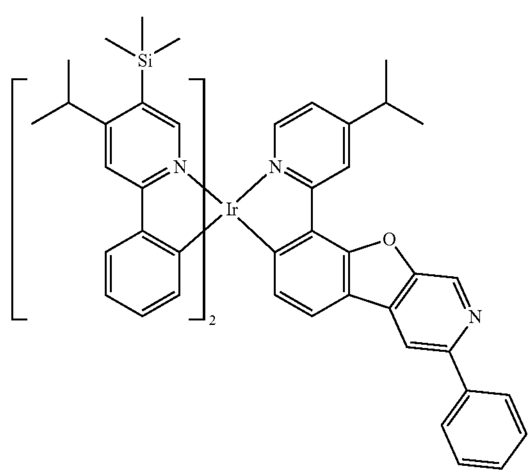

-continued
694
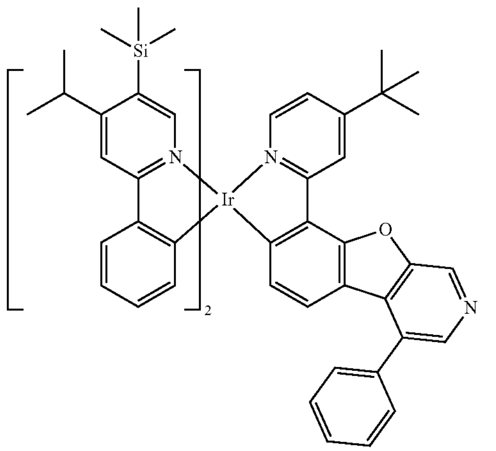
695
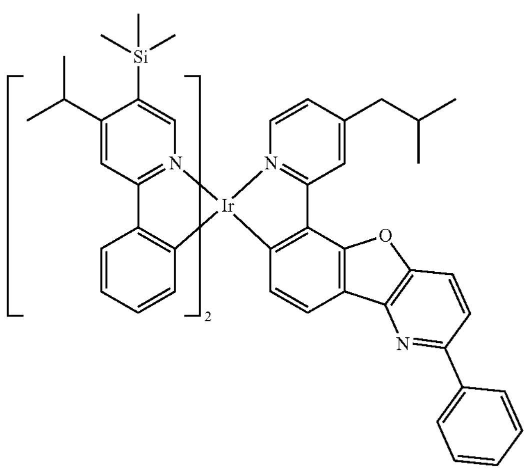
696
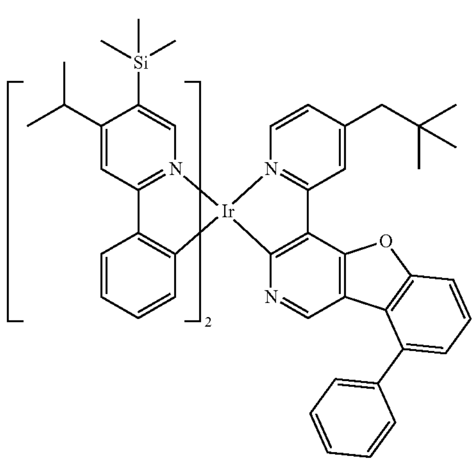
-continued
697
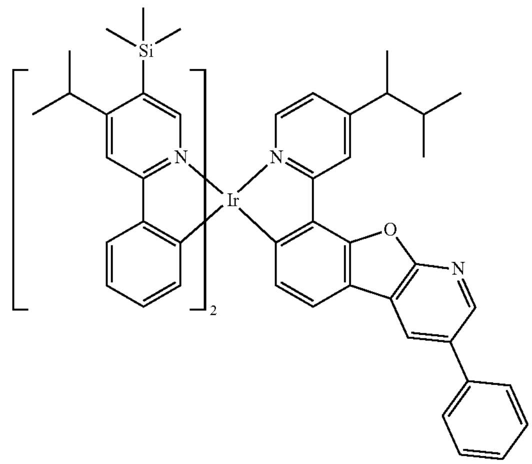
698
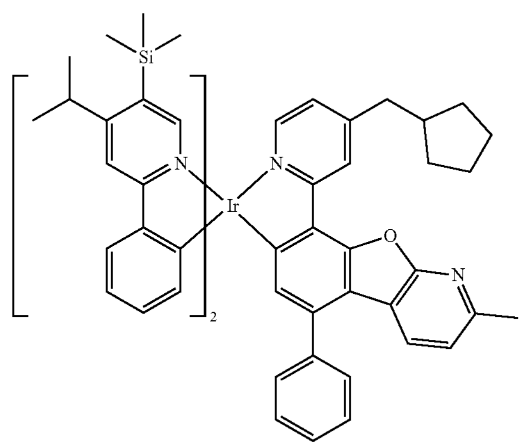
699
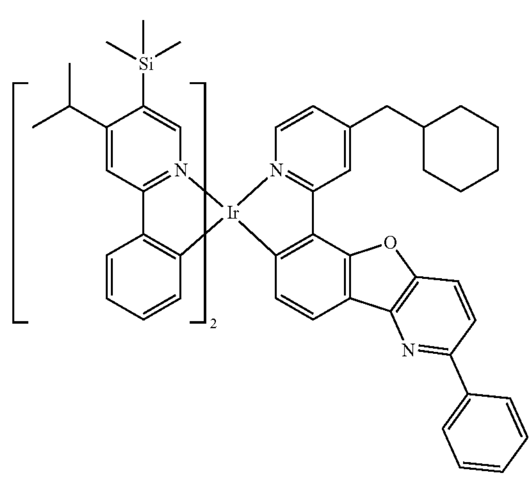

-continued
700
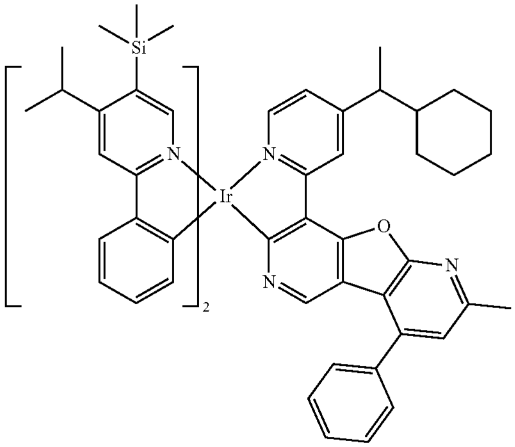
701
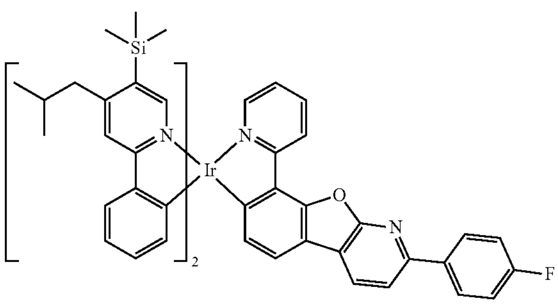
702
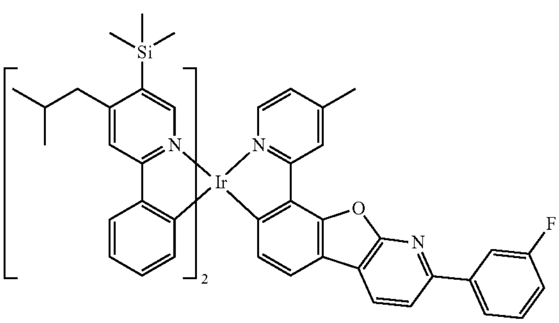
703
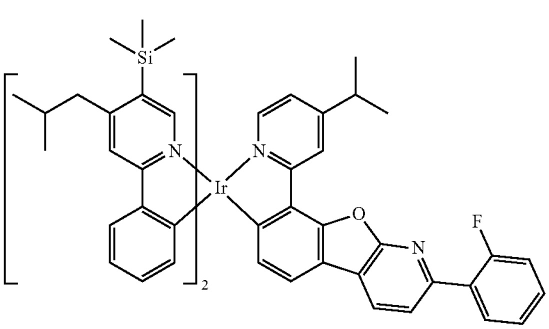
-continued
704
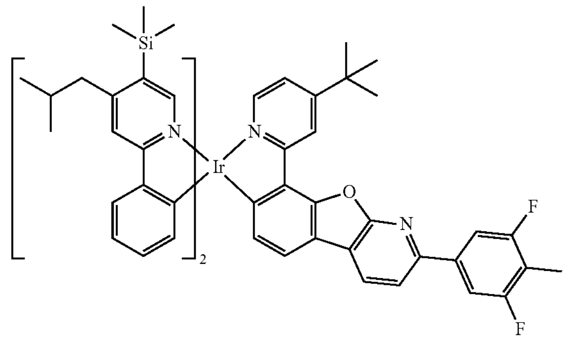
705
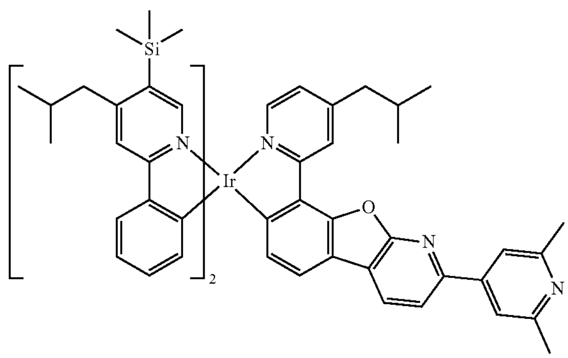
706
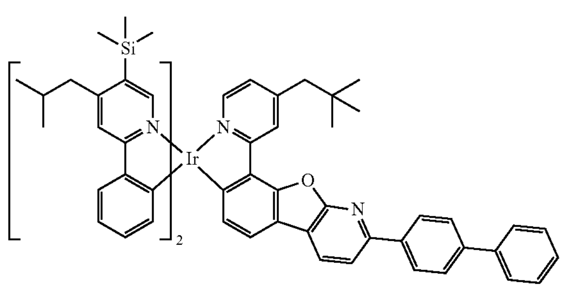
707
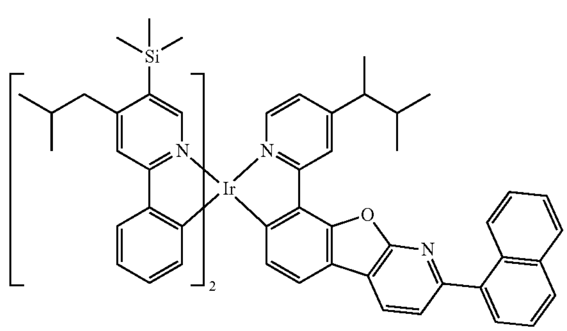

708
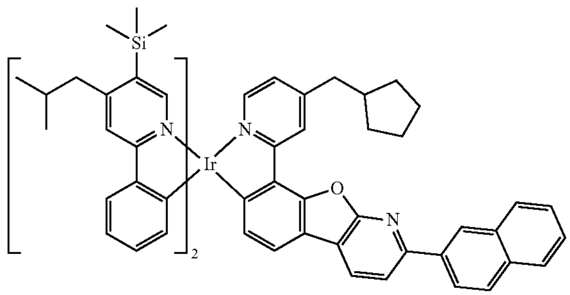
709
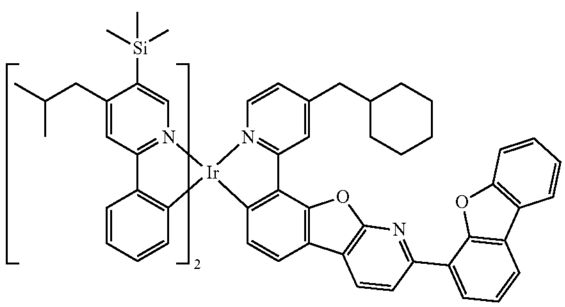
710
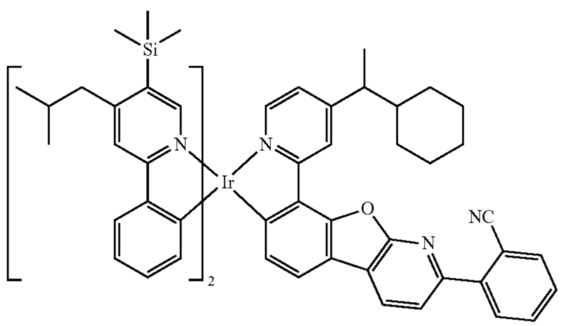
711
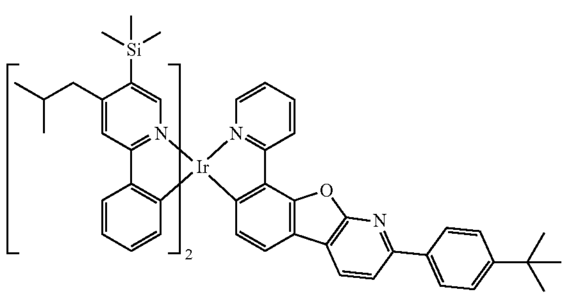
712
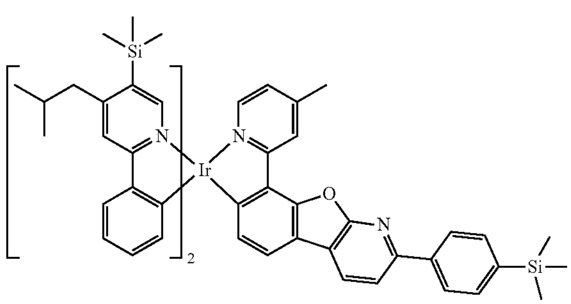
713
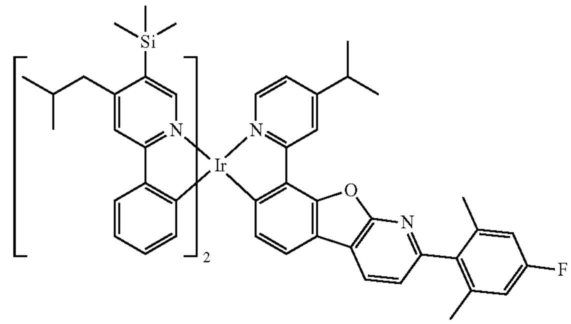
714
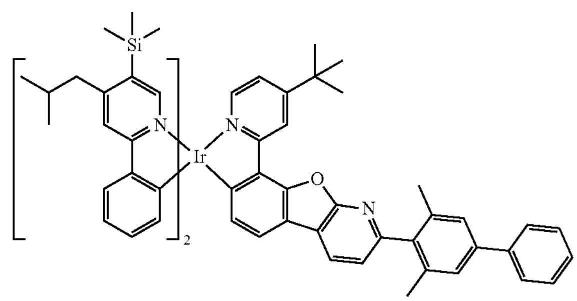
715
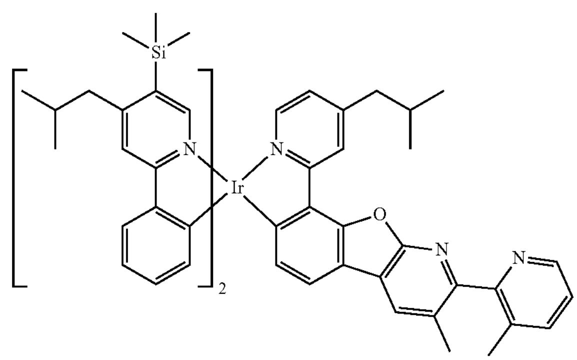
716
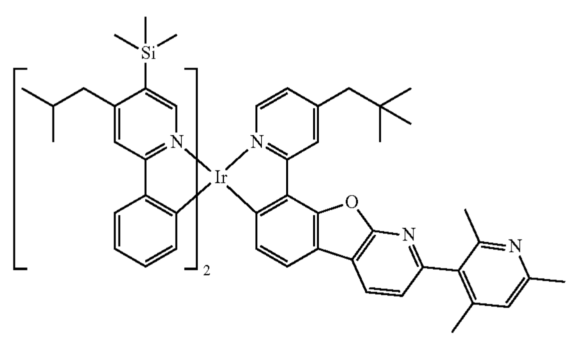

-continued
717
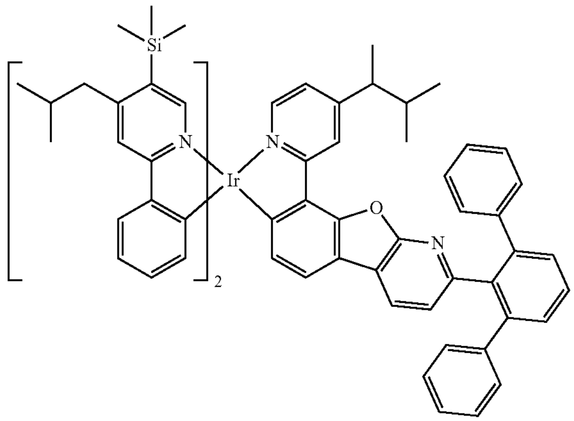
718
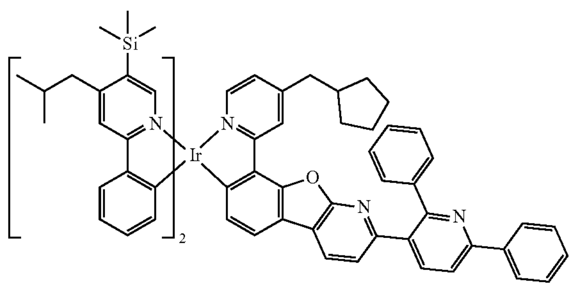
719
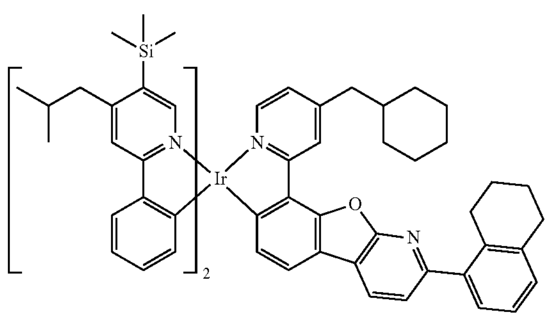
720
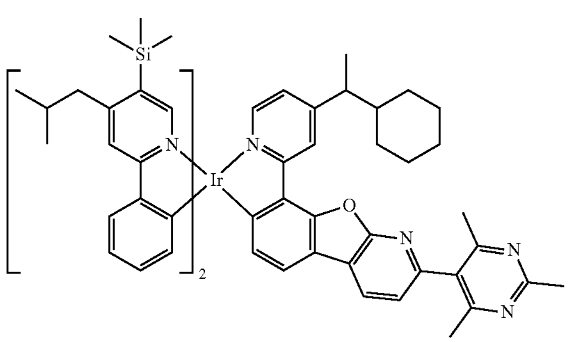
-continued
721
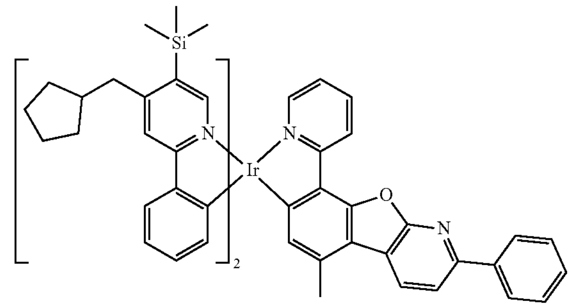
722
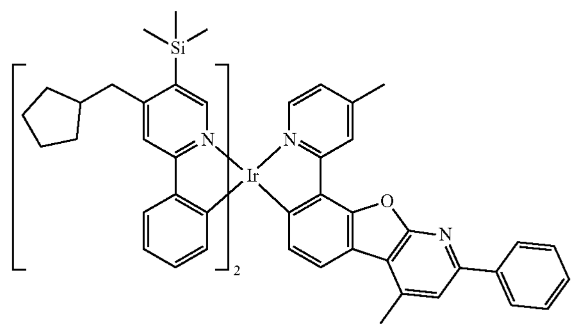
723
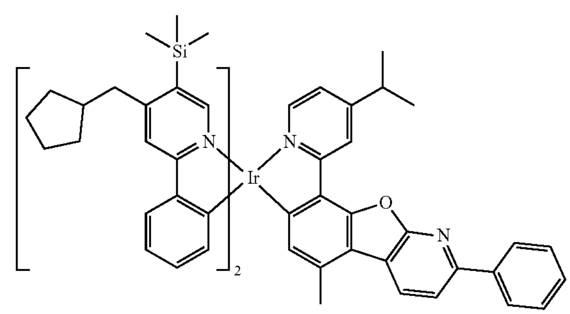
724
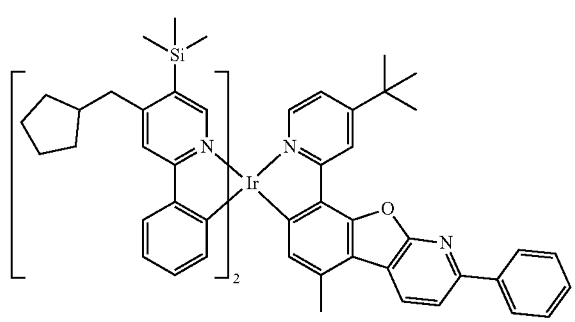

-continued
725
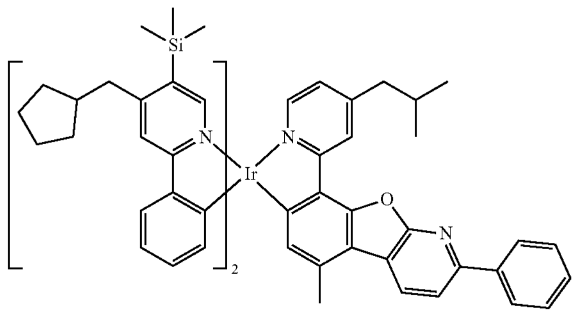
726
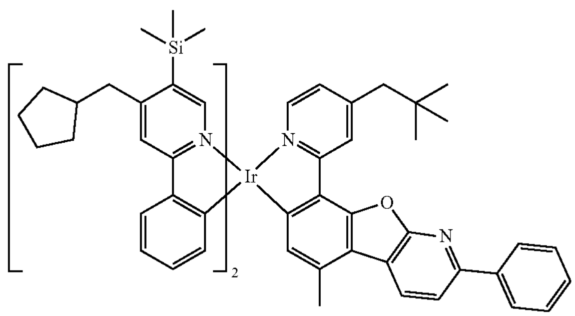
727
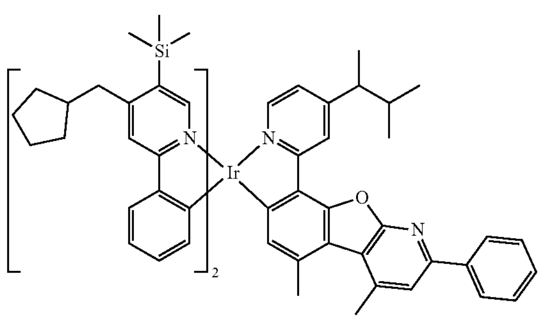
728
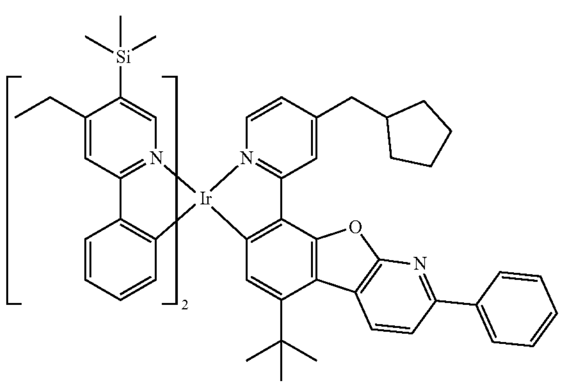
-continued
729
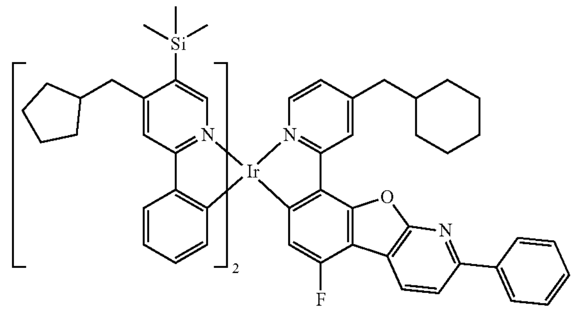
730
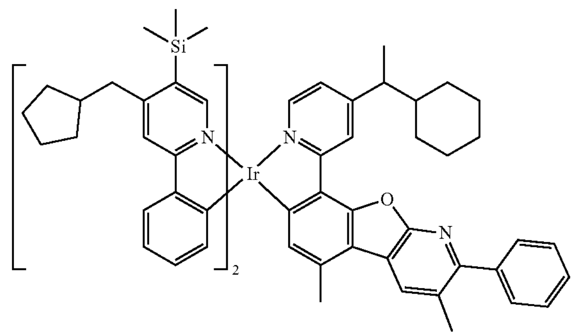
731
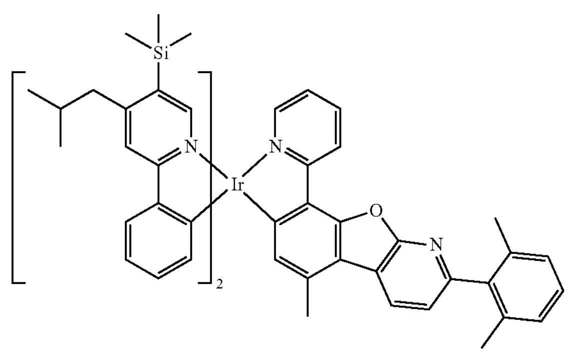
732
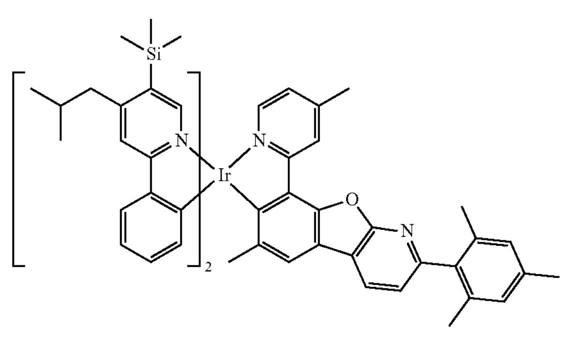

-continued
733
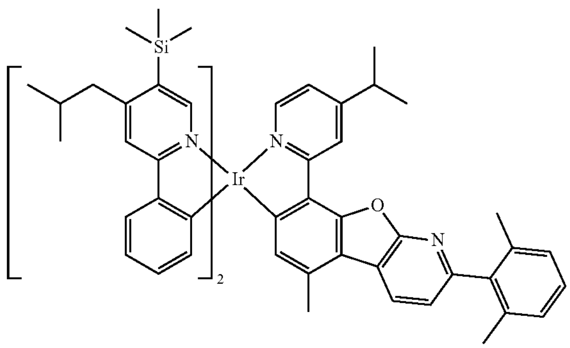
734
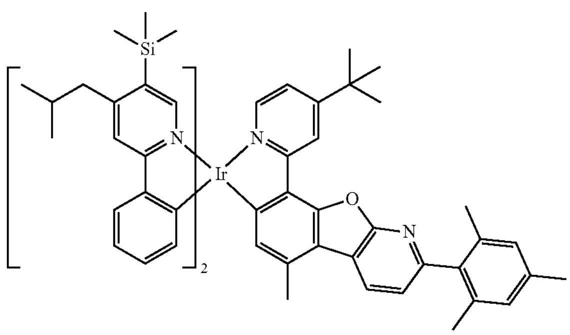
735
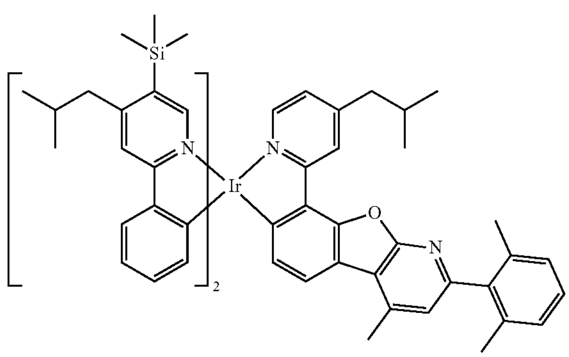
736
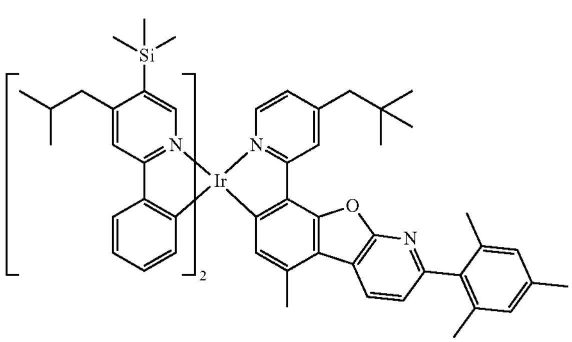
-continued
737
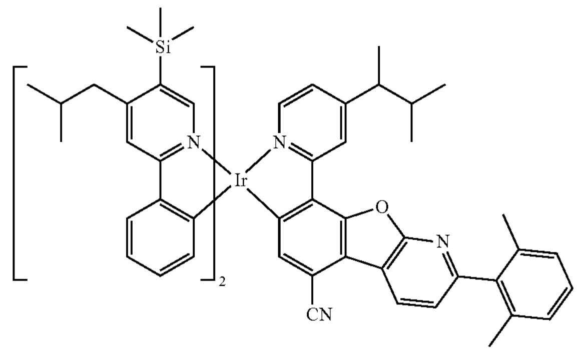
738
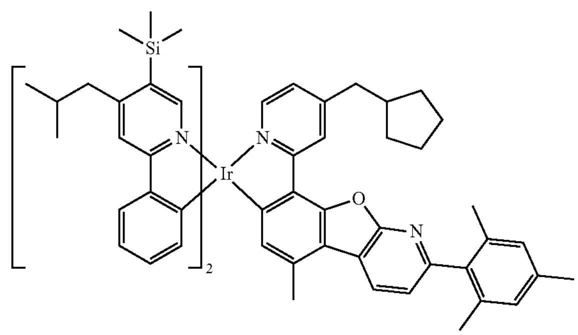
739
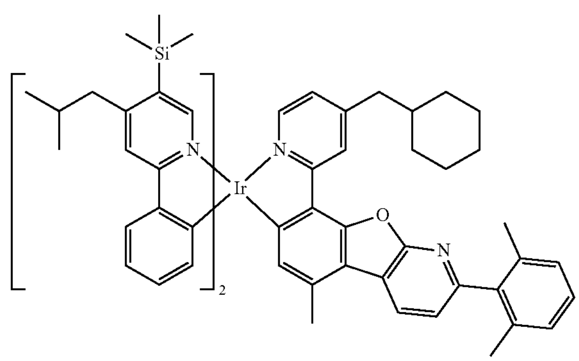
740
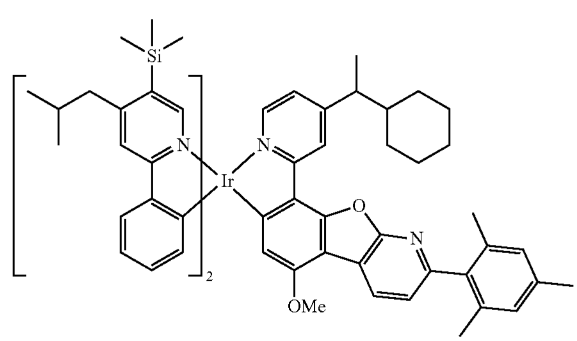

-continued
741
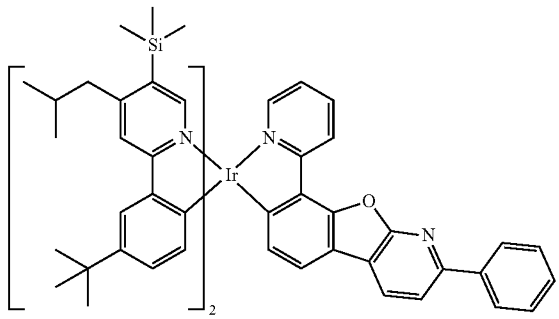
742
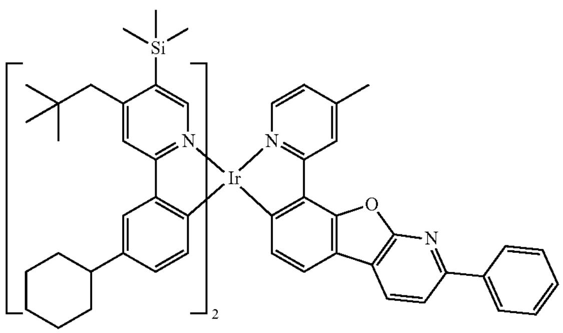
743
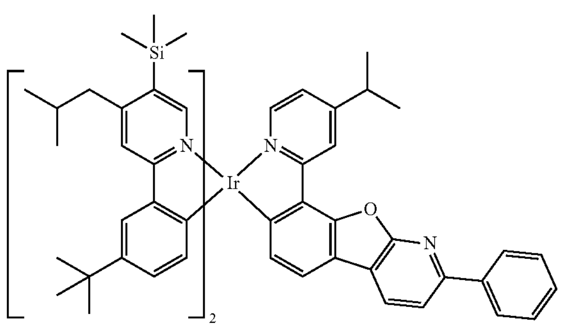
744
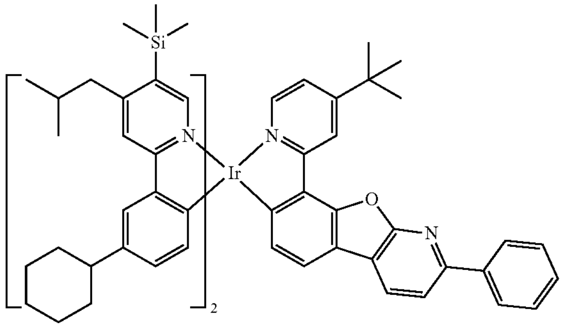
-continued
745
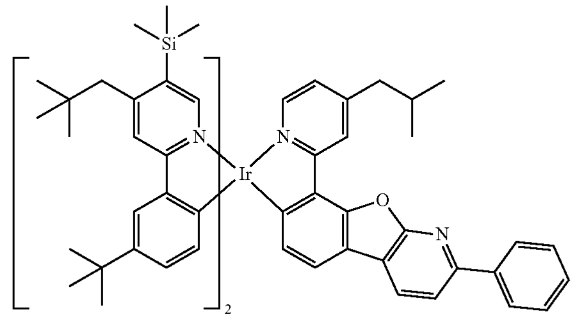
746
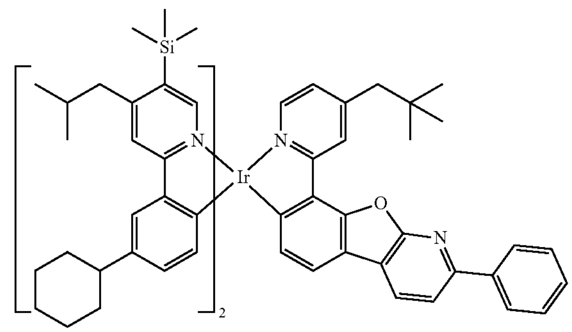
747
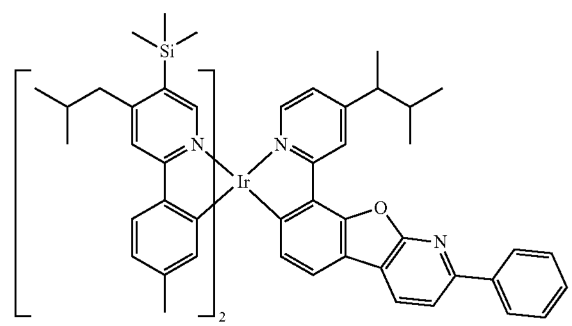
748
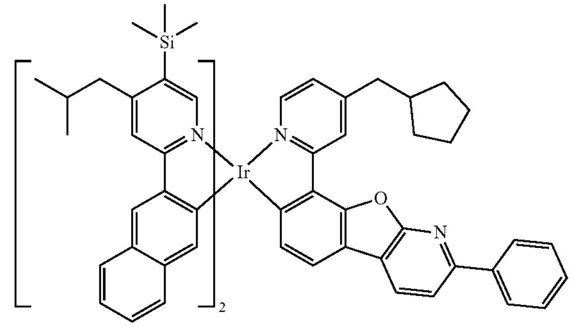

749
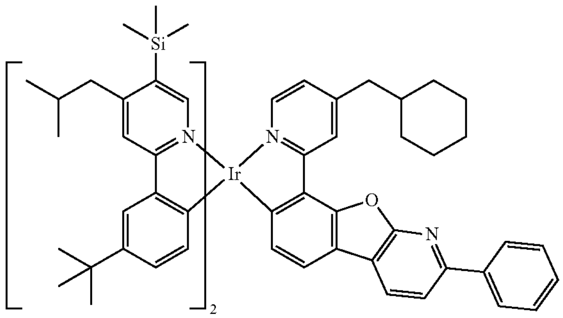
750
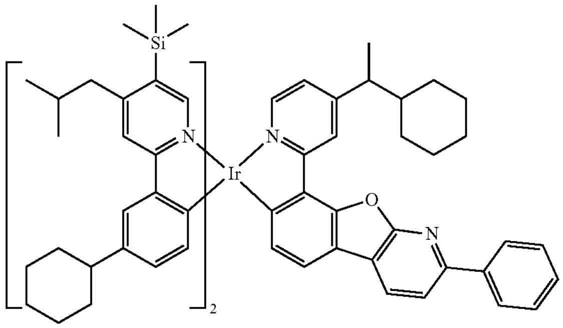
751
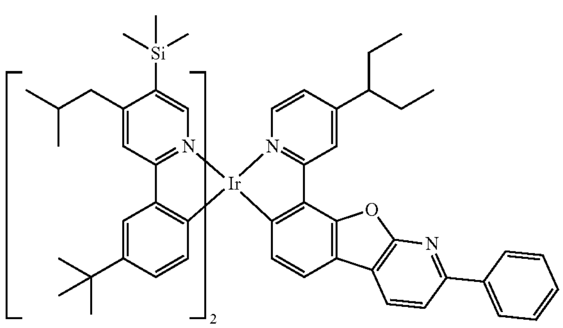
752
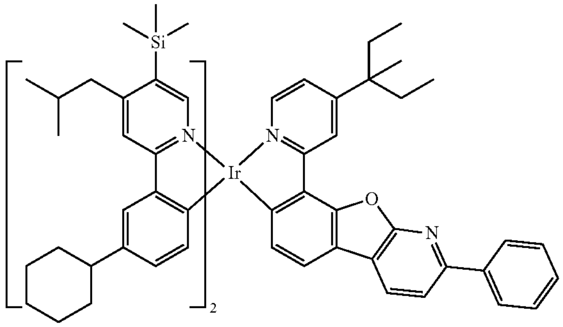
753
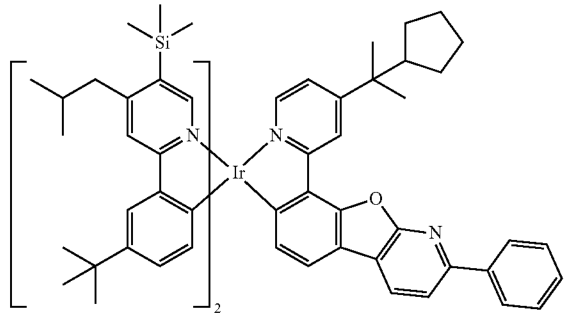
754
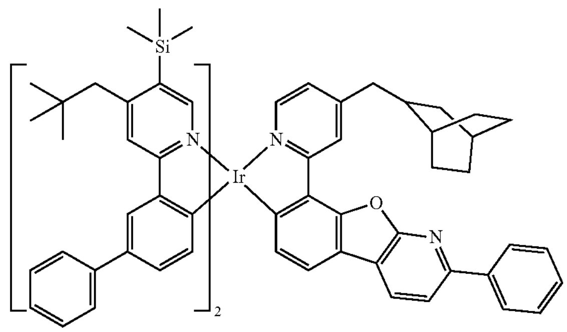
755
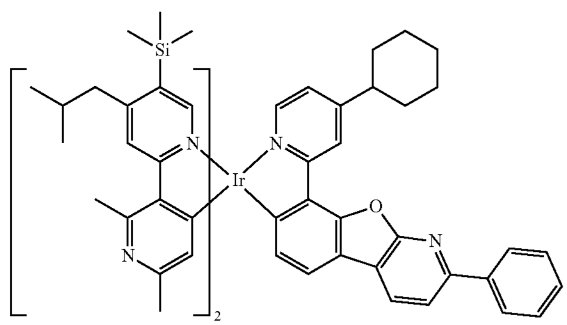
756
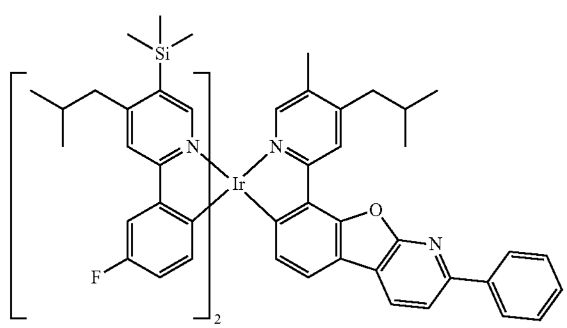

-continued
757
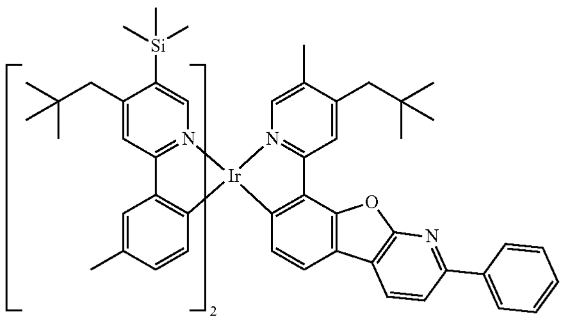
758
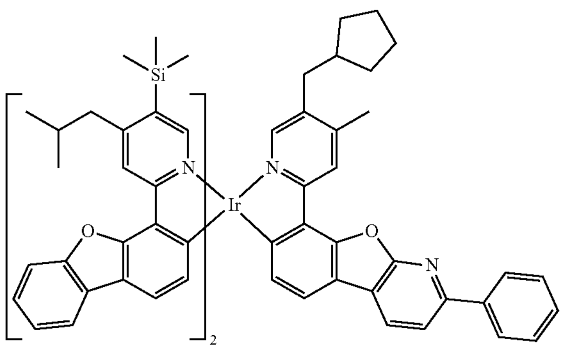
759
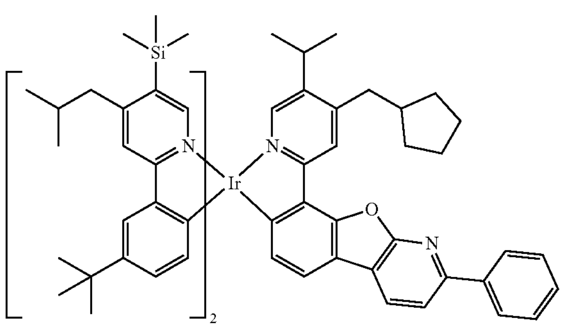
760
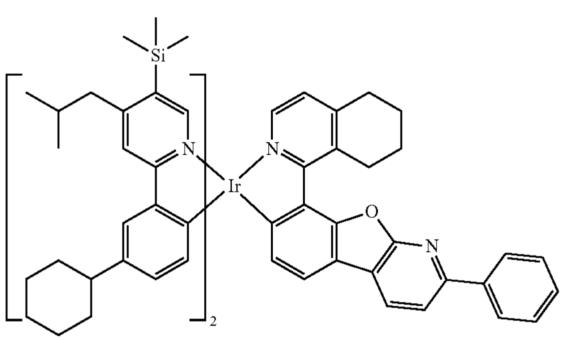
-continued
761
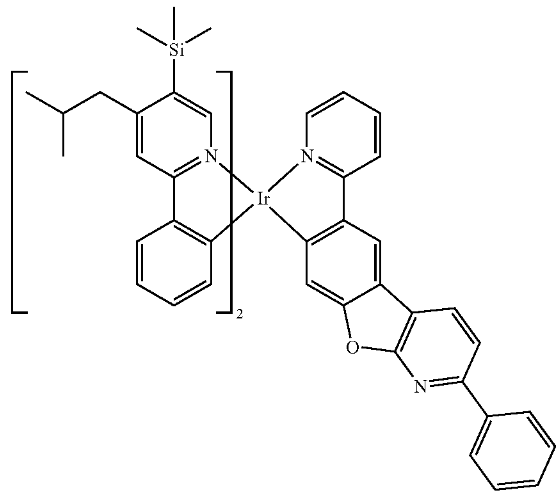
762
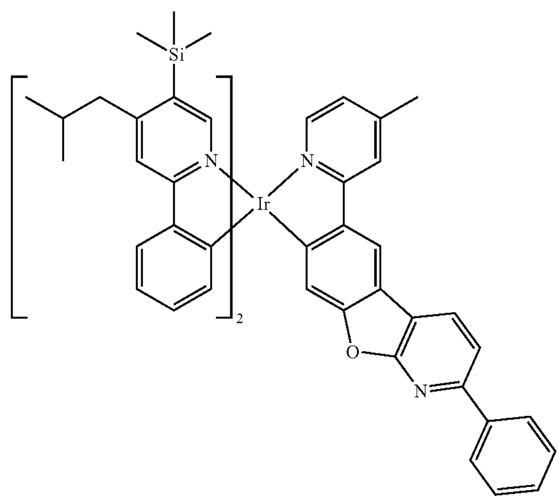
763
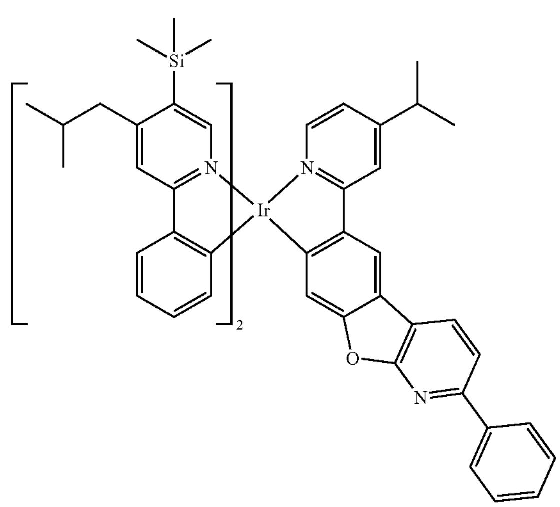

-continued
764
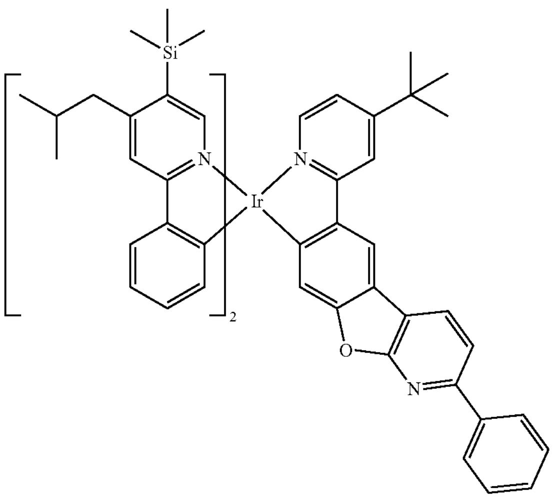
765
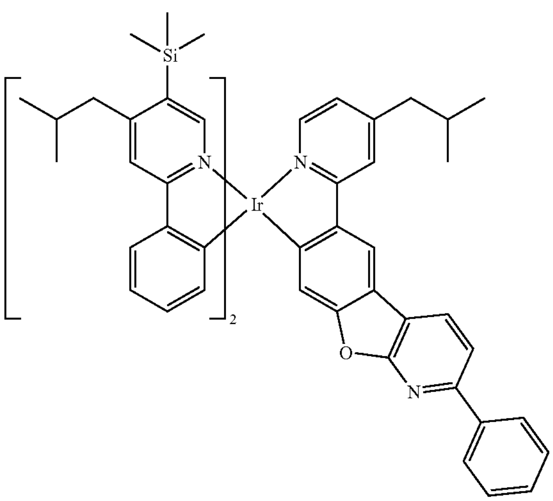
766
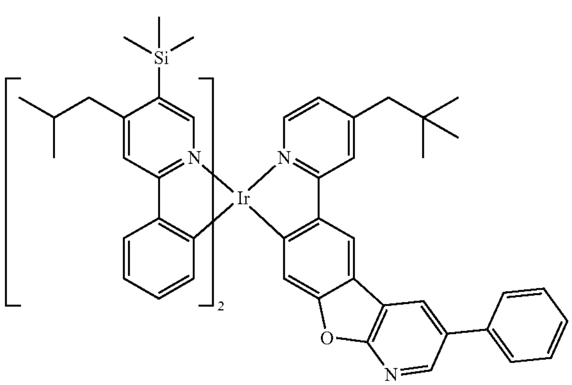
-continued
767
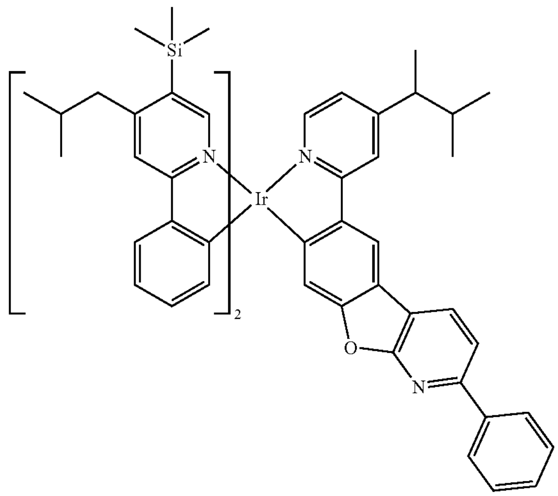
768
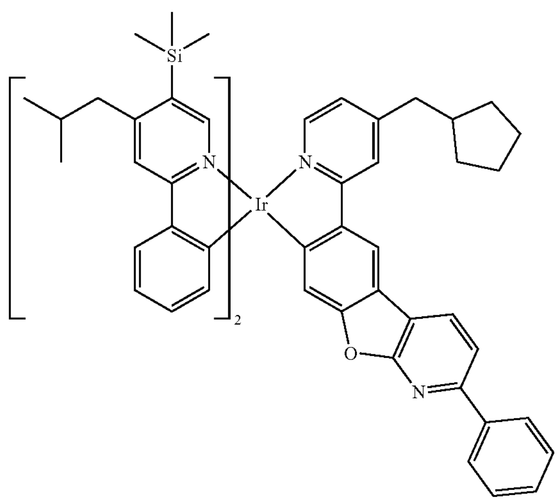
769
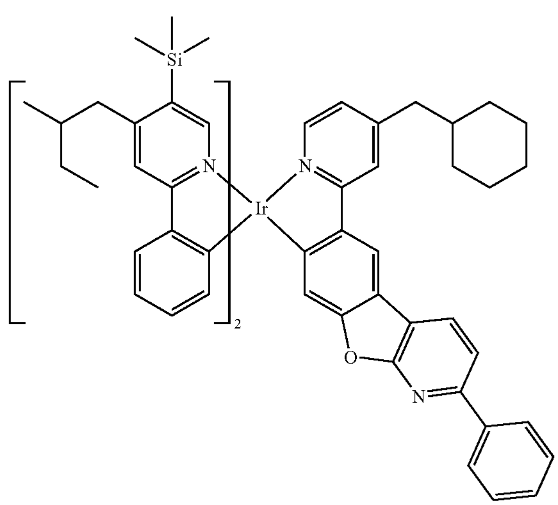

-continued
770
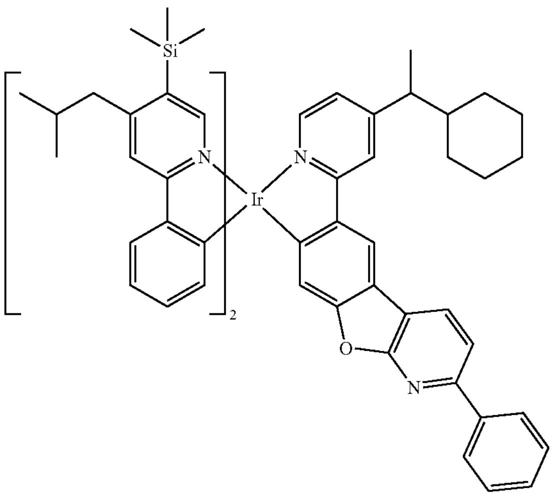
771
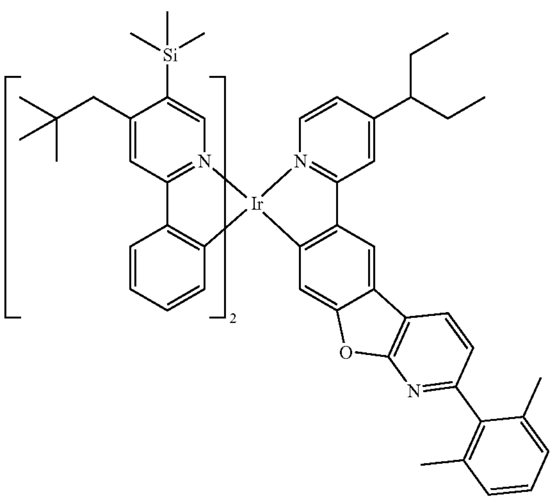
772
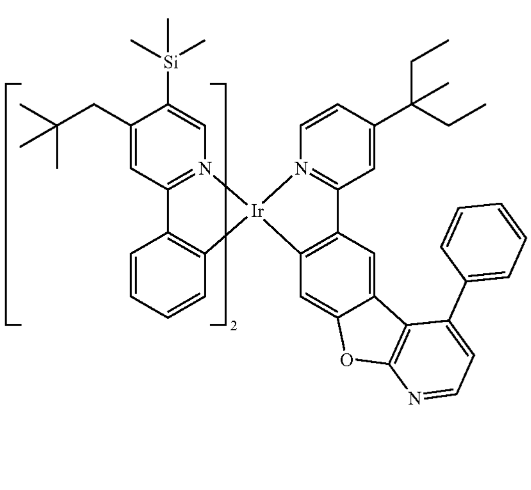
-continued
773
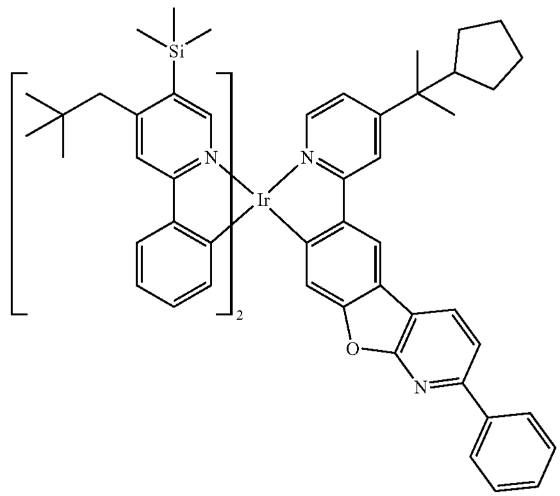
774
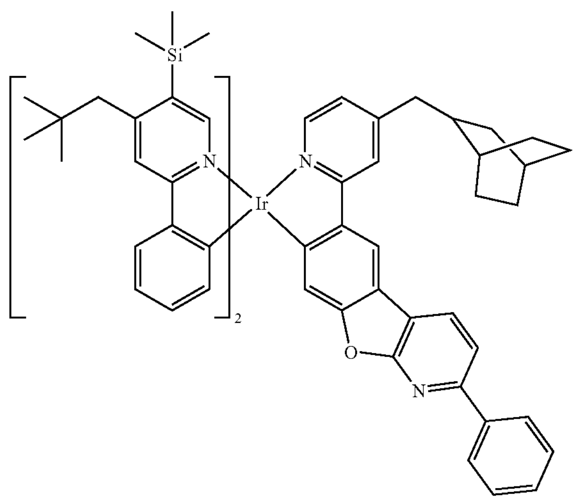
775
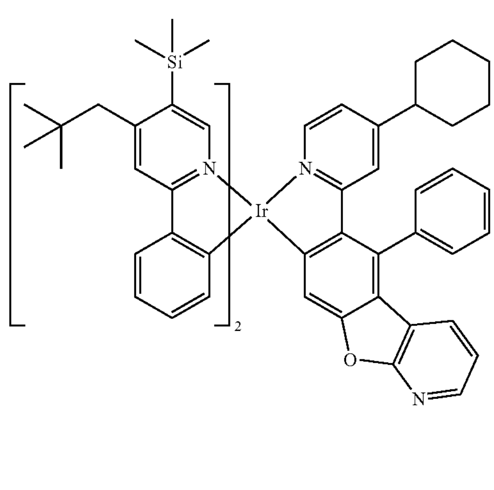

-continued
776
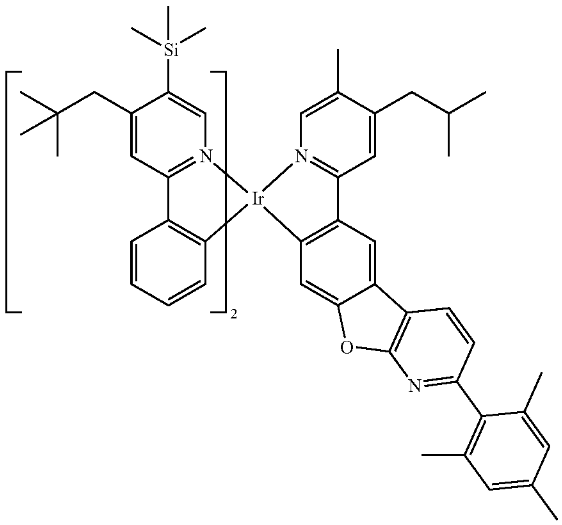
777
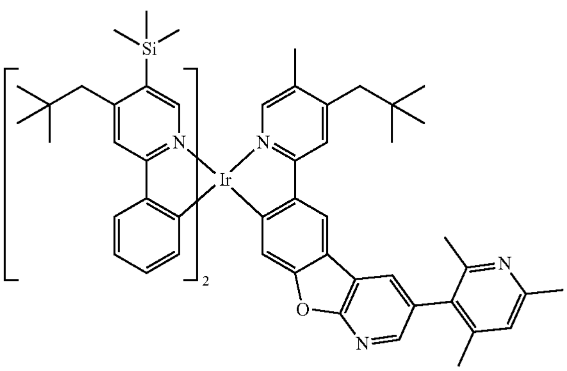
778
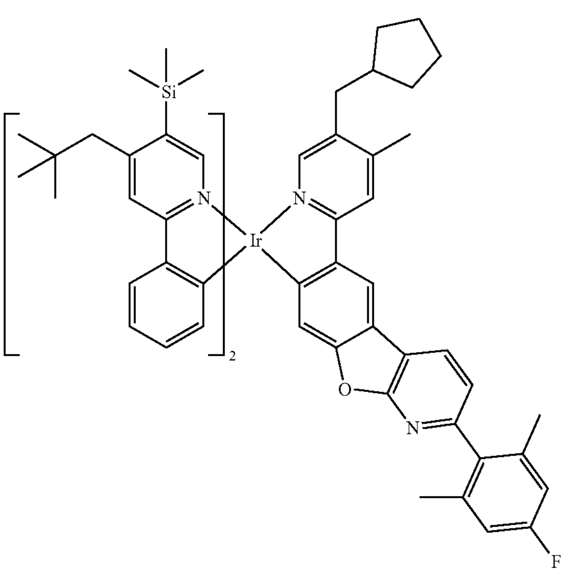
-continued
779
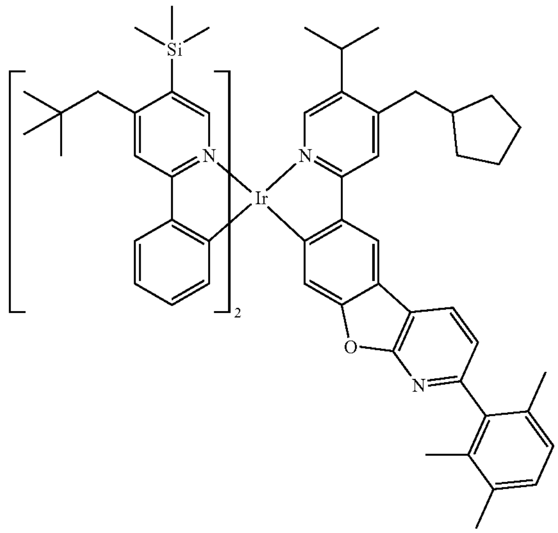
780
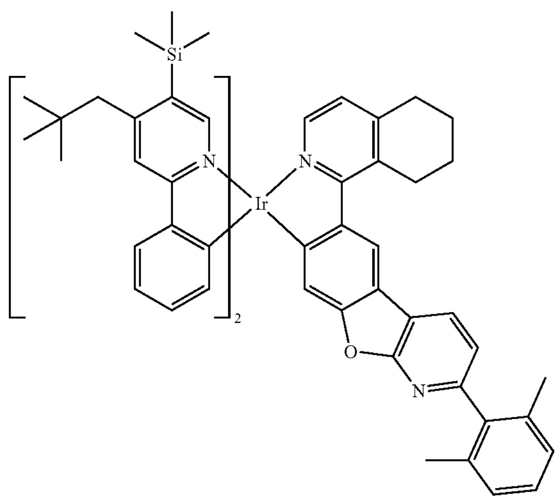
781
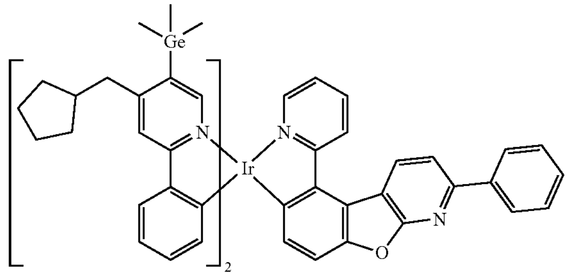

-continued
782
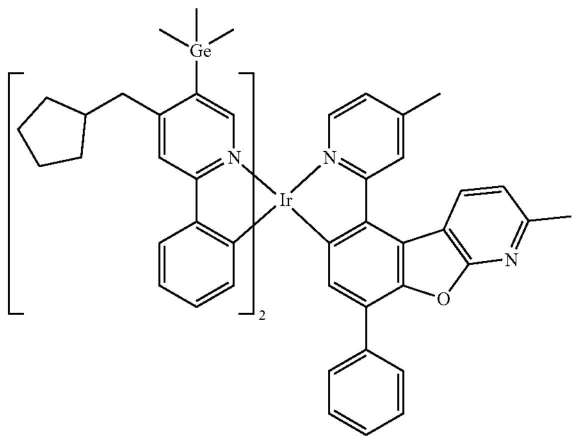
783
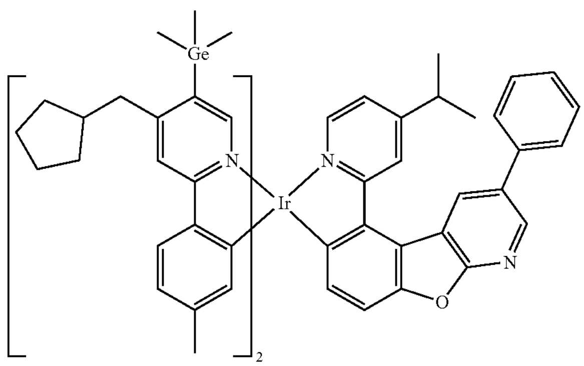
784
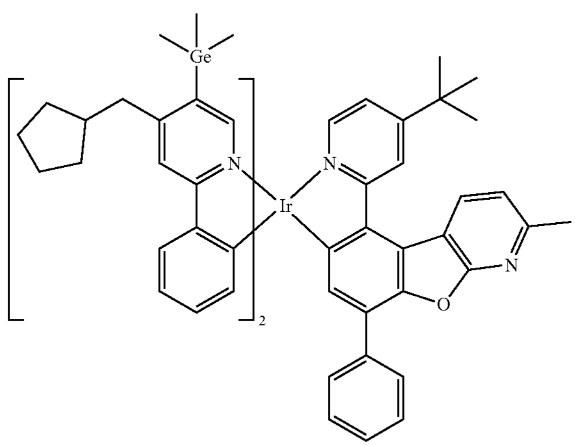
785
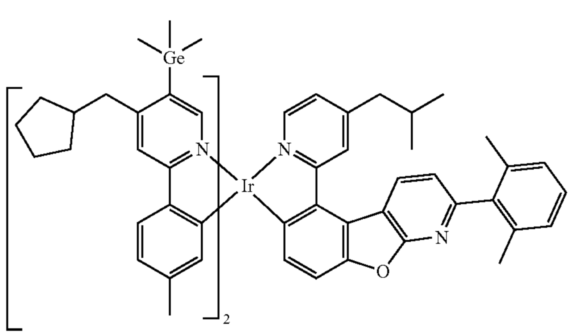
-continued
786
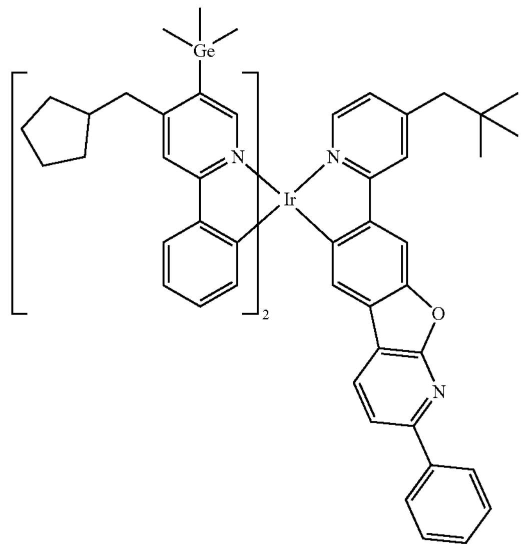
787
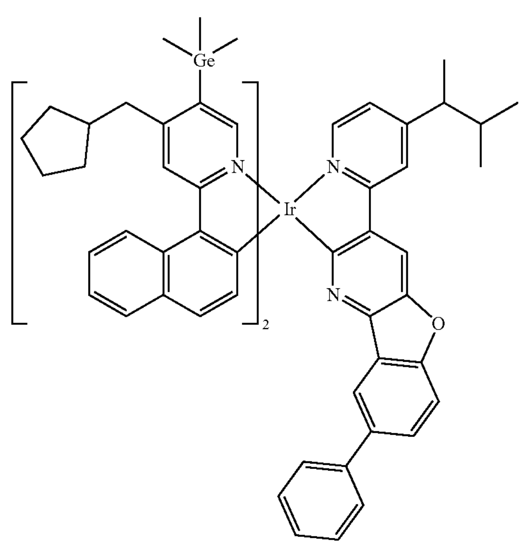

788
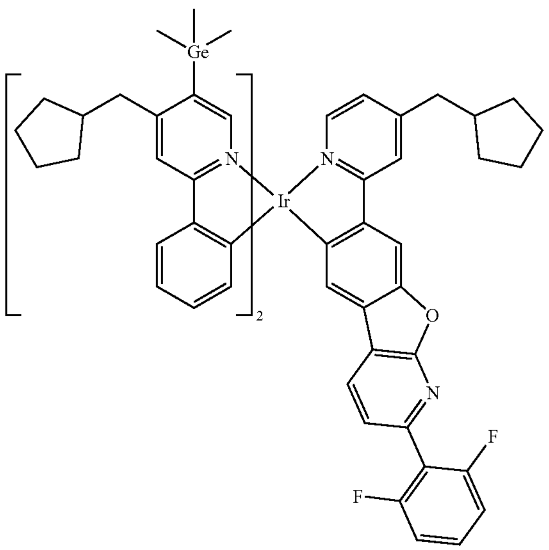
789
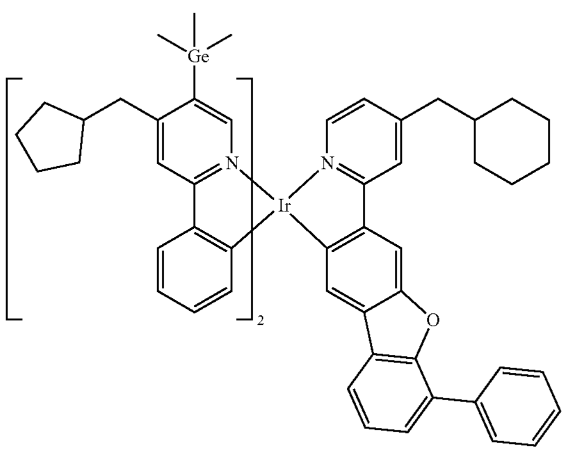
790
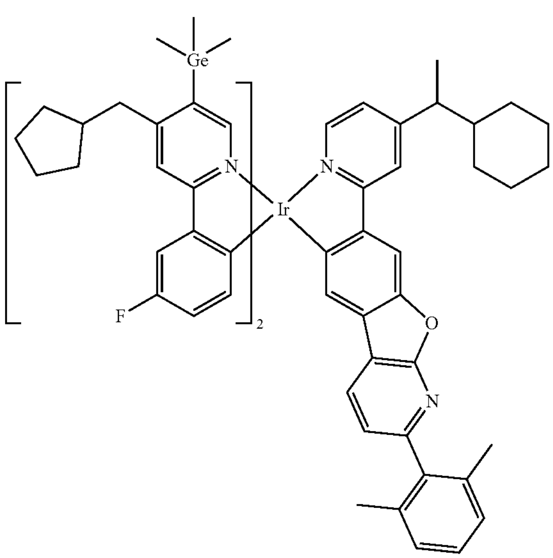
791
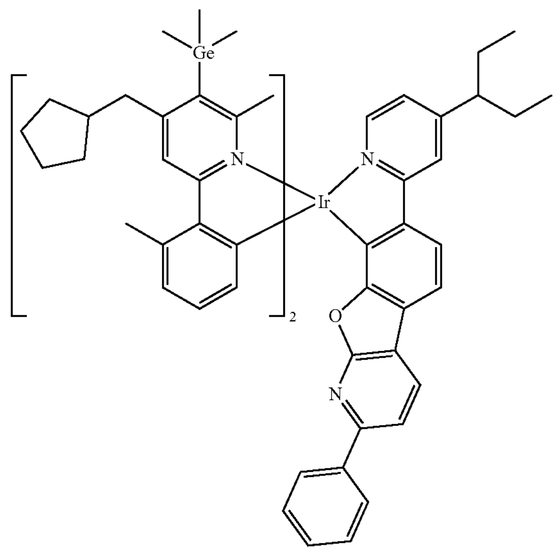
792
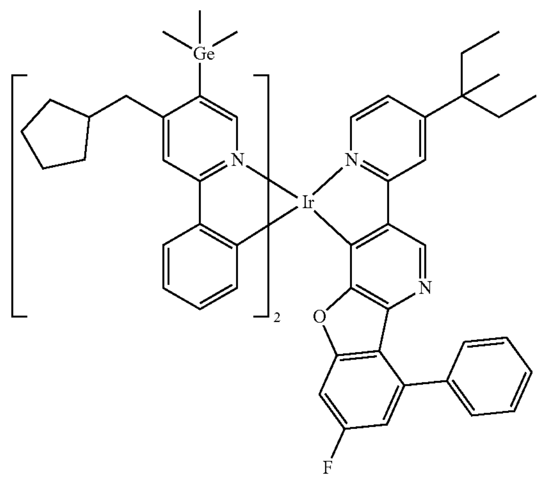
793
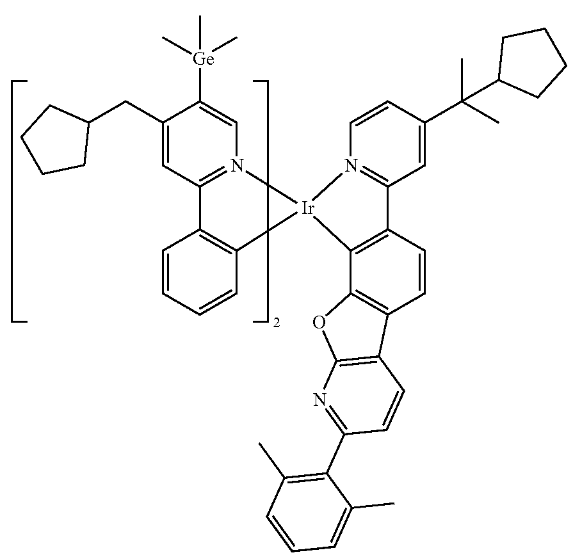

-continued
794
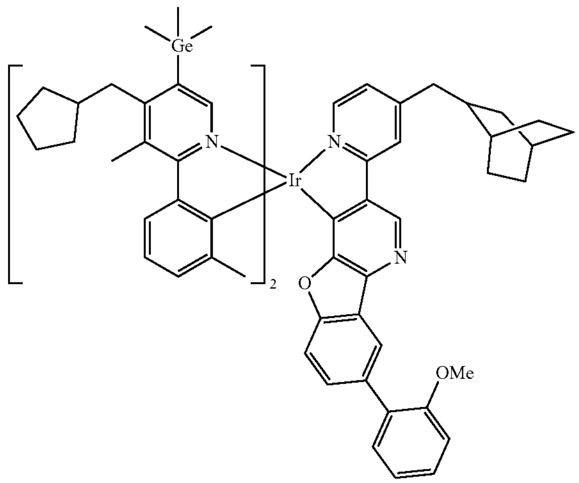
797
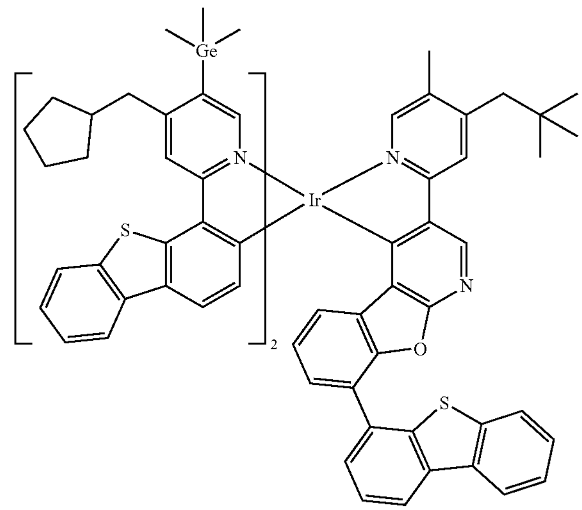
795
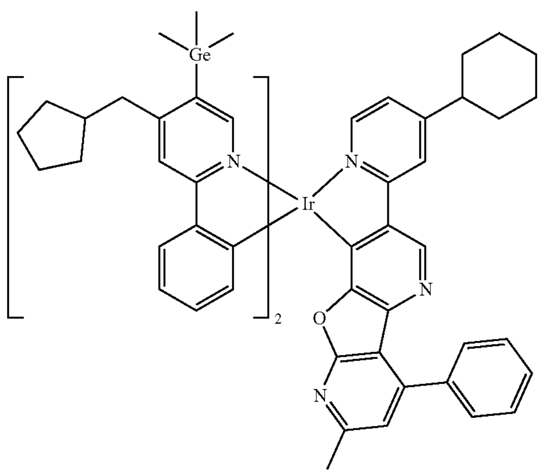
798
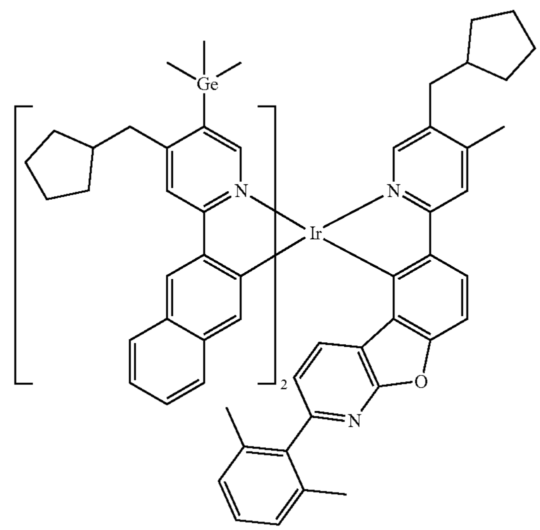
796
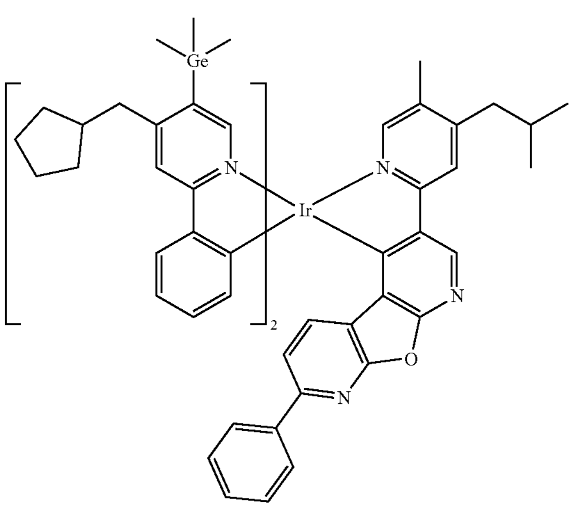
799
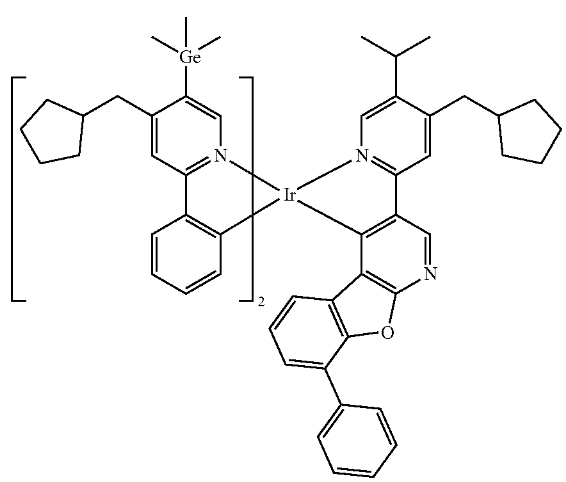

-continued
800
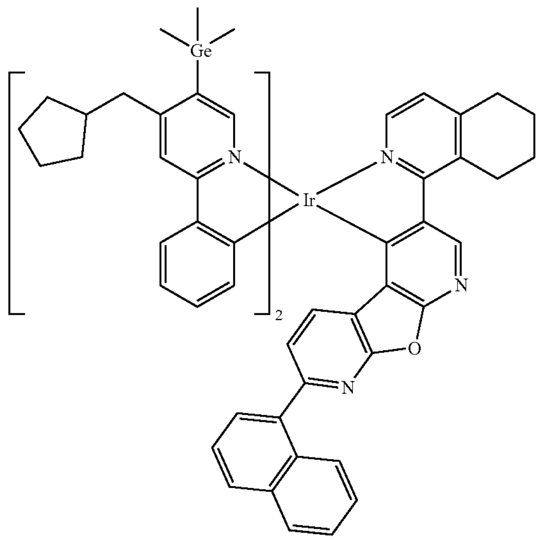
801
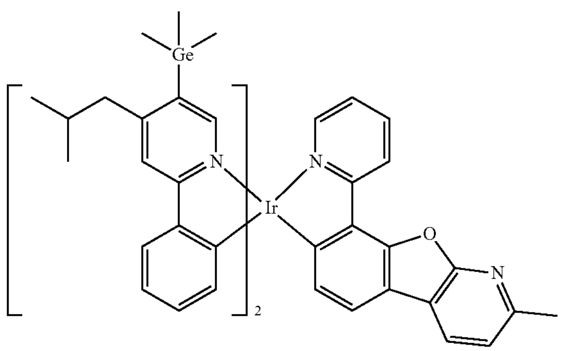
802
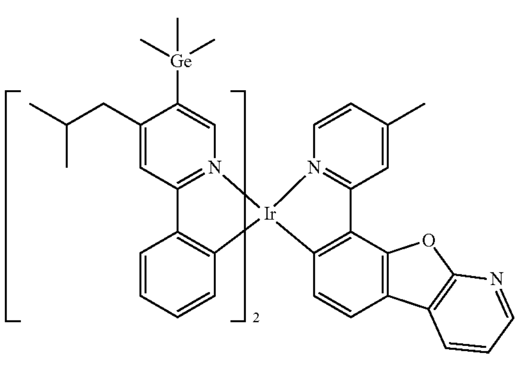
-continued
803
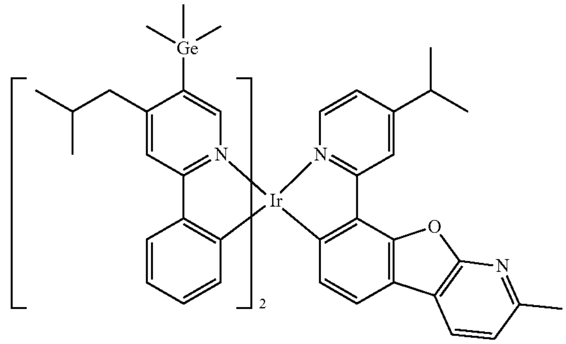
804
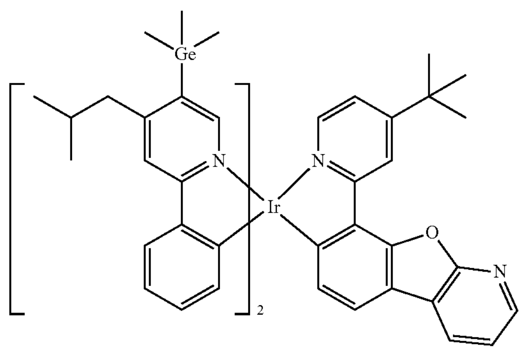
805
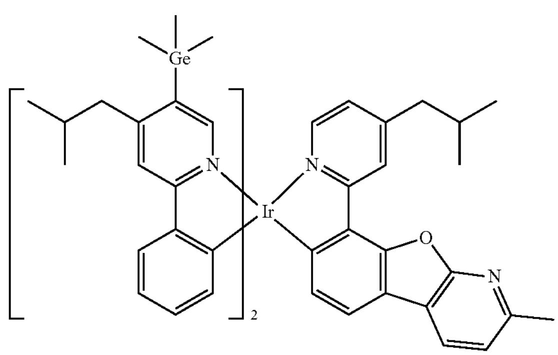
806
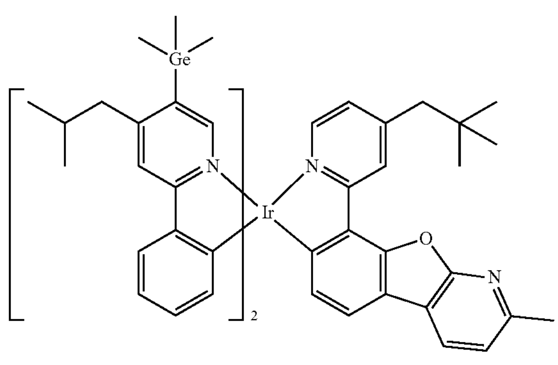

-continued
807
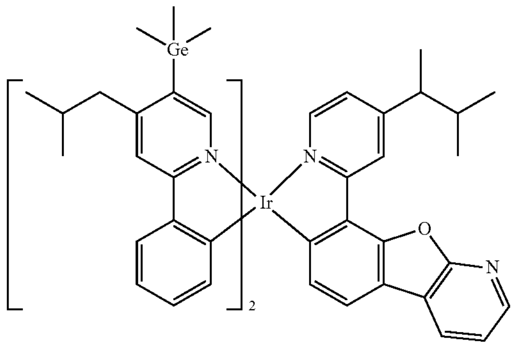
808
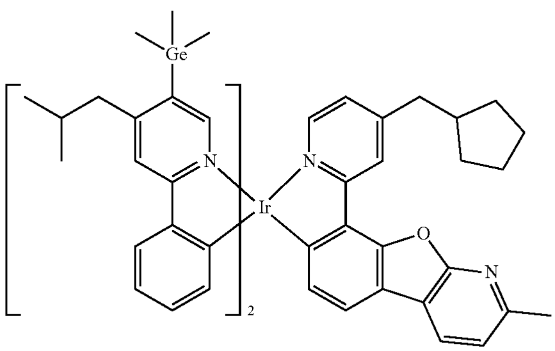
809
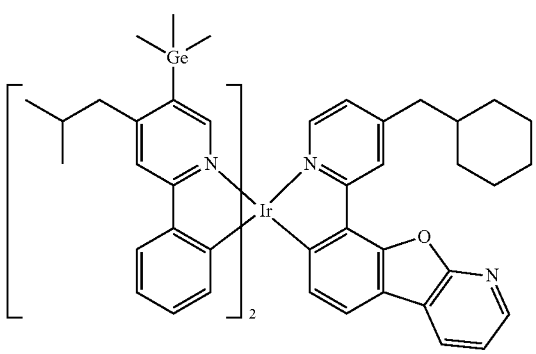
810
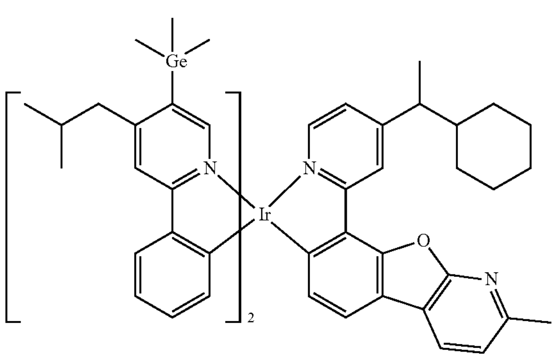
-continued
811
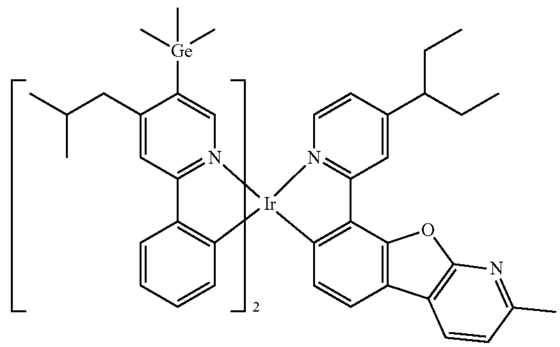
812
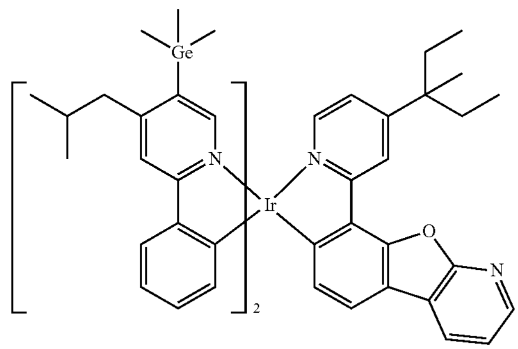
813
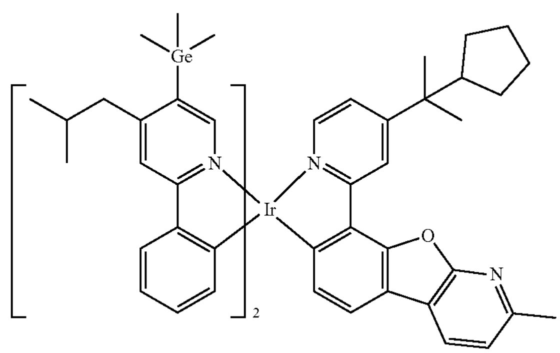
814
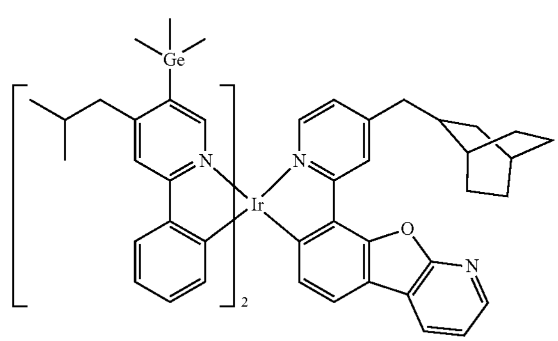

815
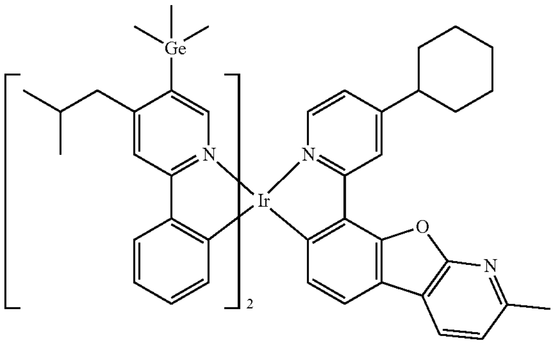
816
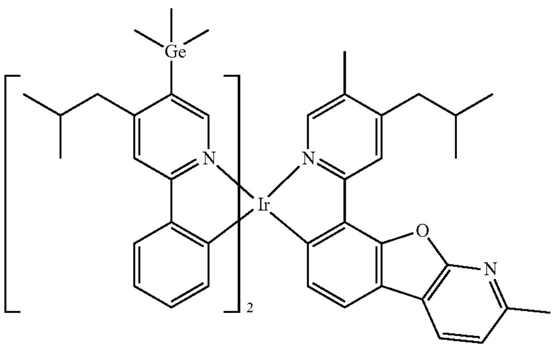
817
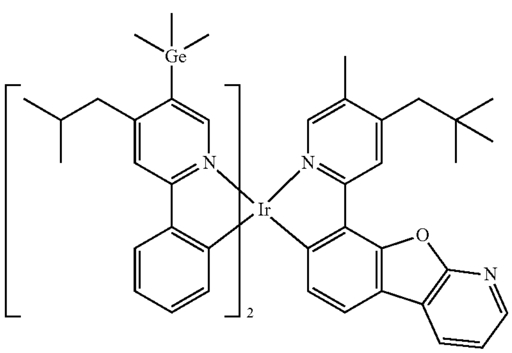
818
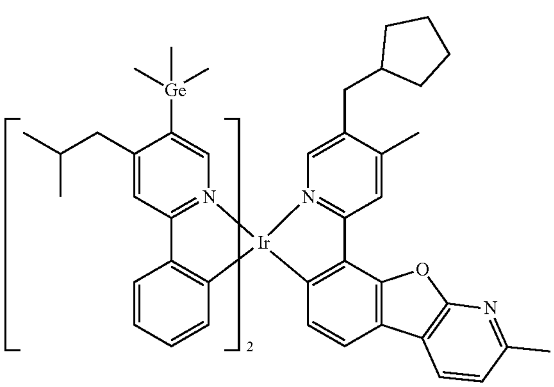
819
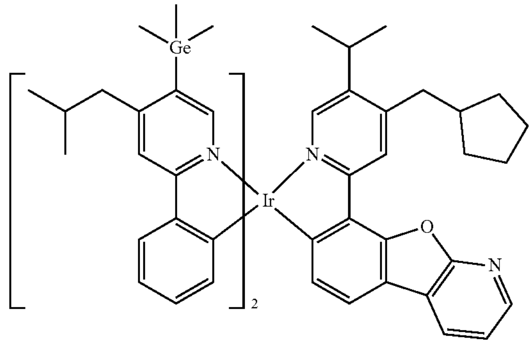
820
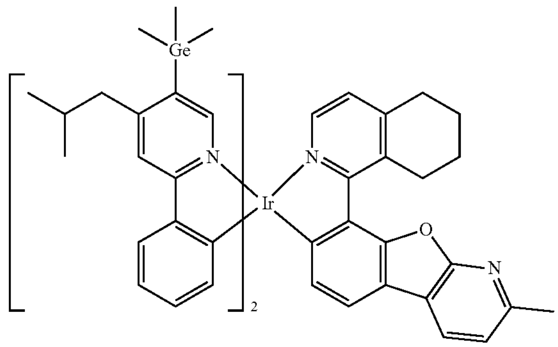
821
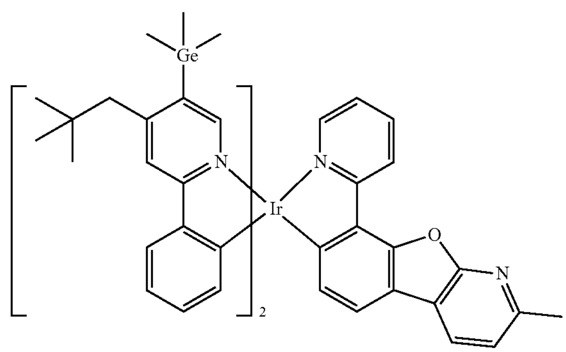
822
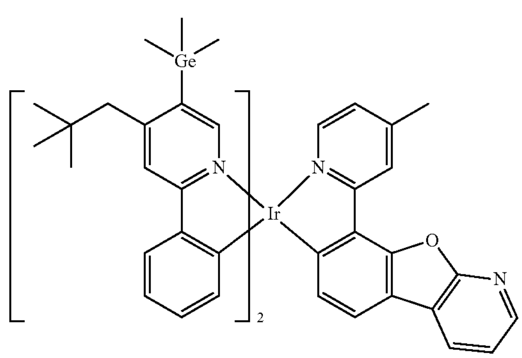

823
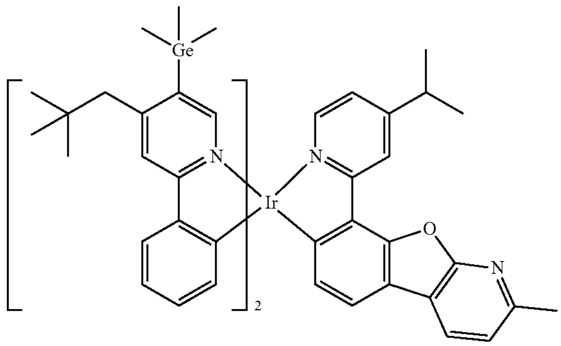
824
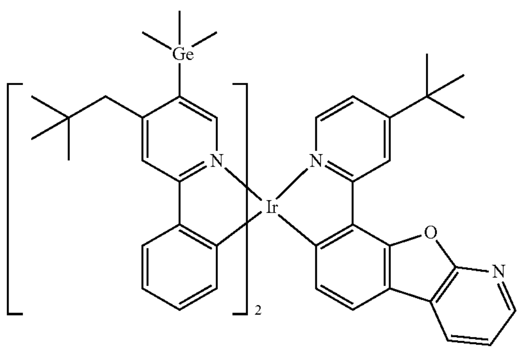
825
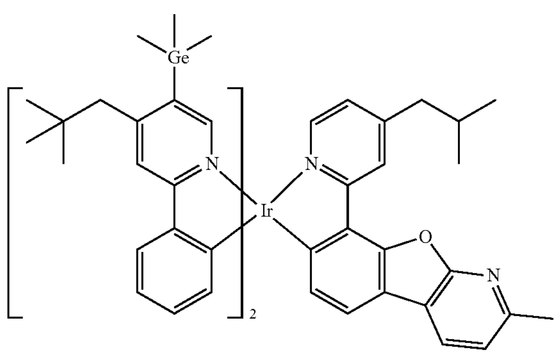
826
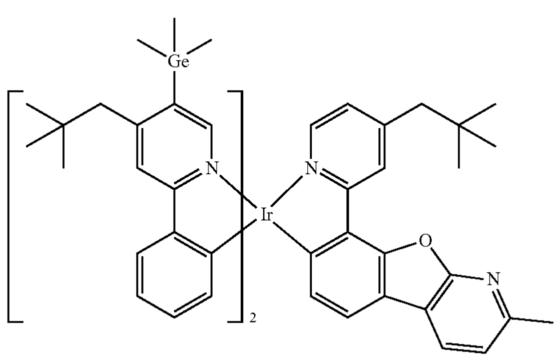
827
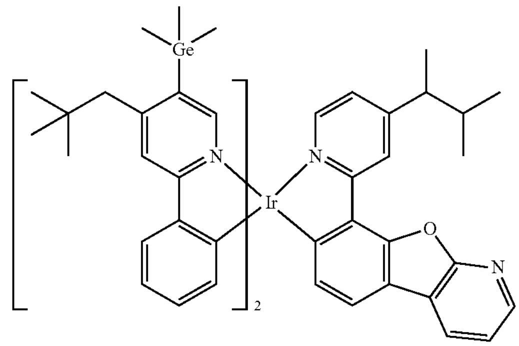
828
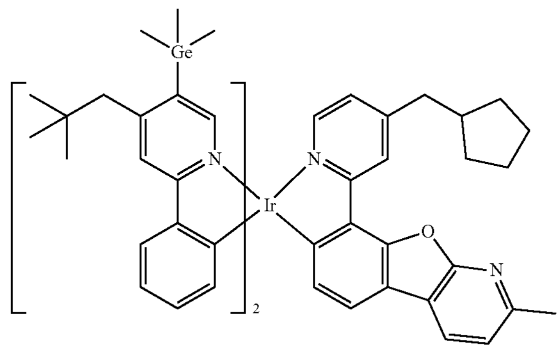
829
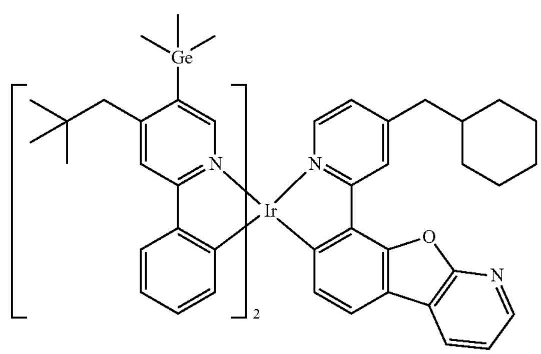
830
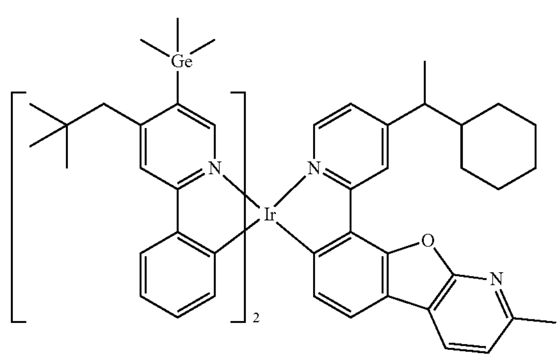

831
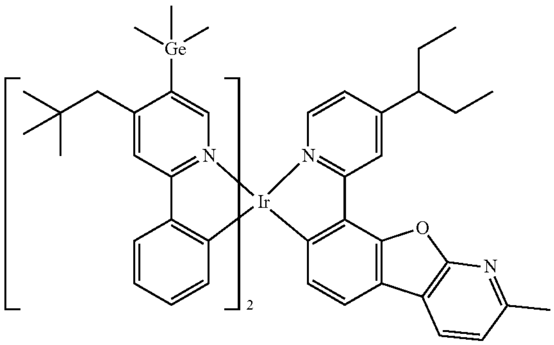
832
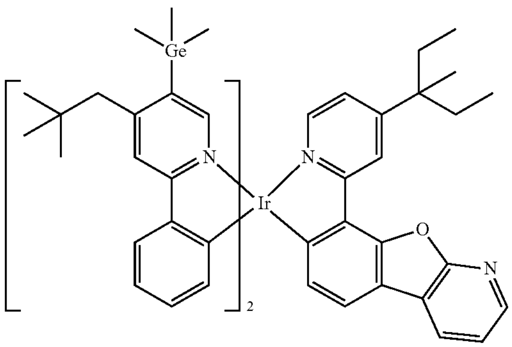
833
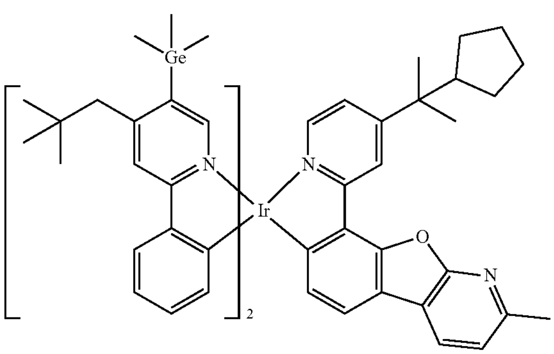
834
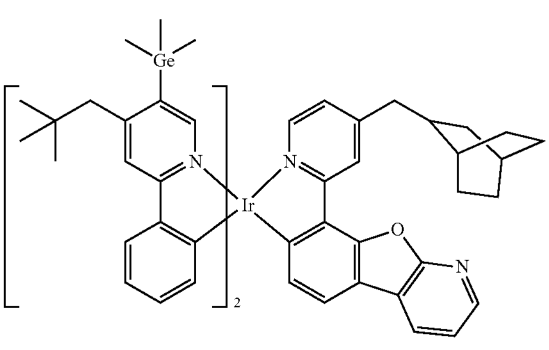
835
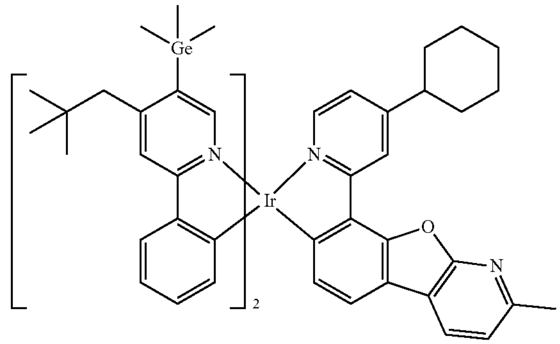
836
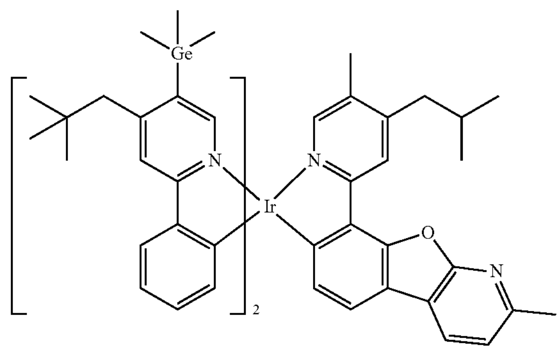
837
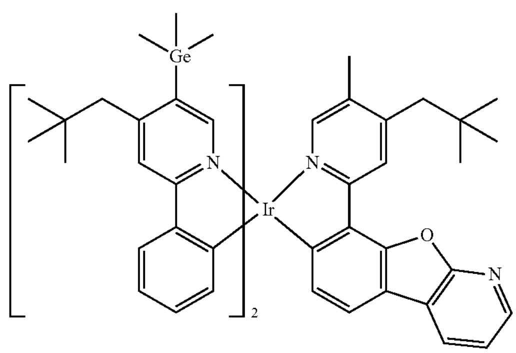
838
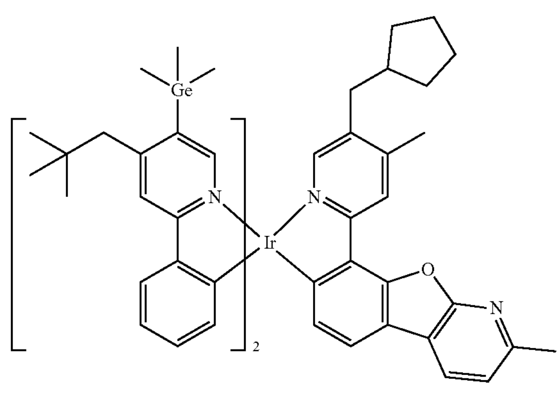

-continued
839
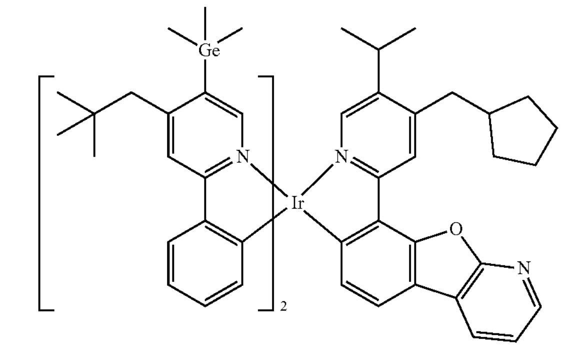
840
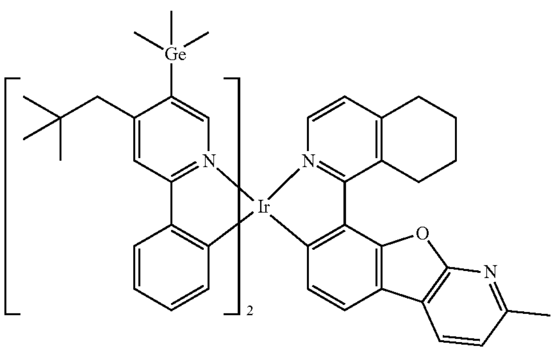
841
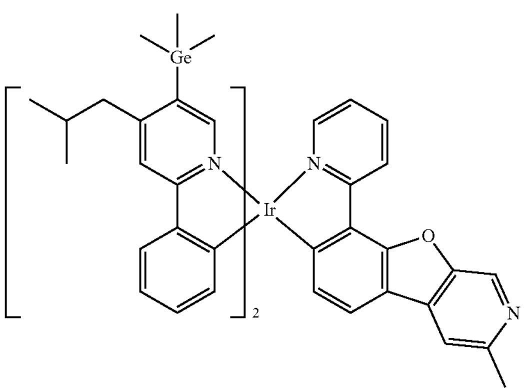
842
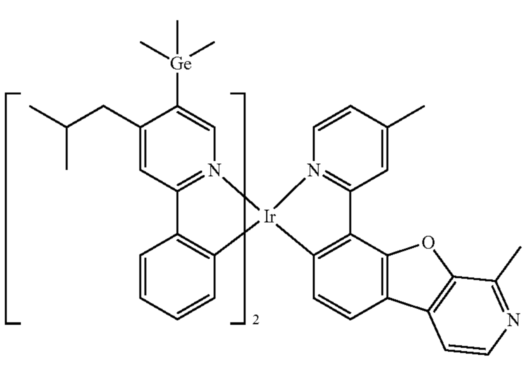
-continued
843
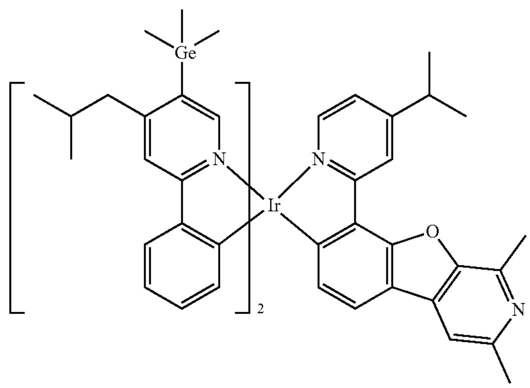
844
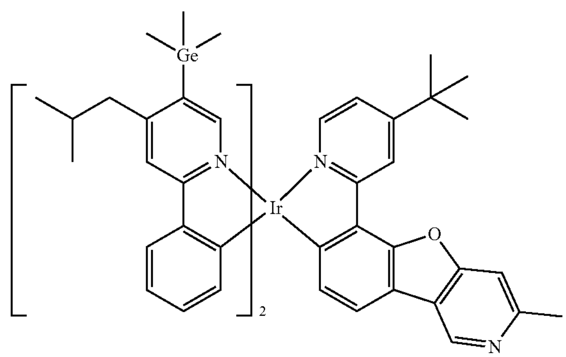
845
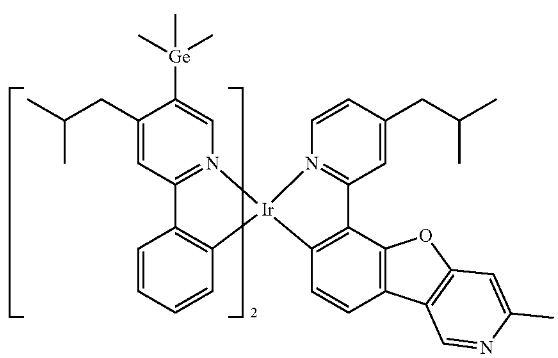
846
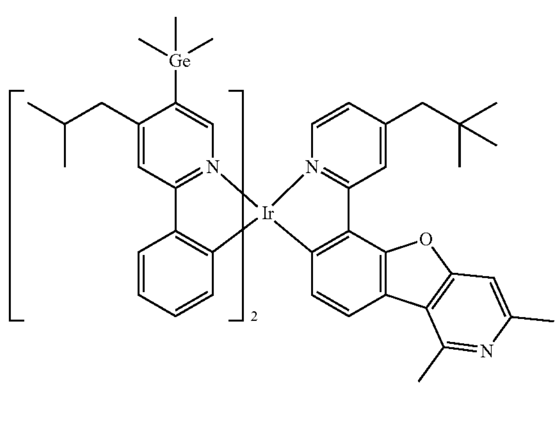

847
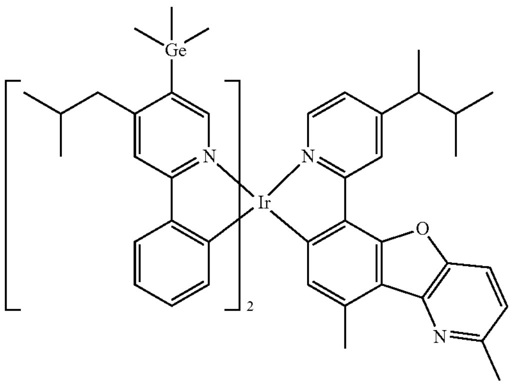
848
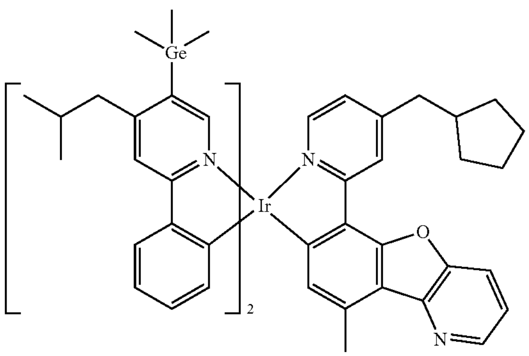
849
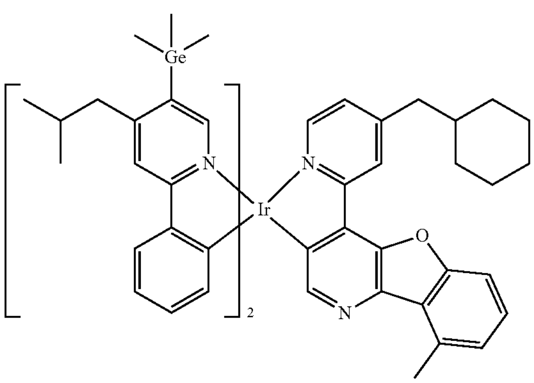
850
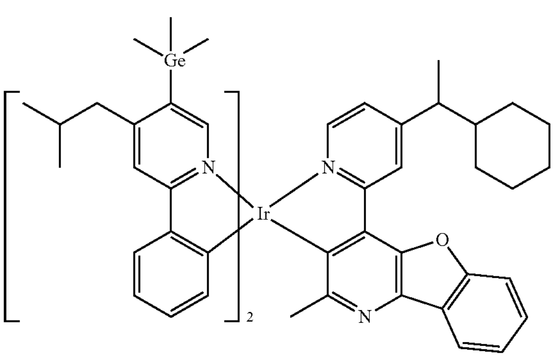
851
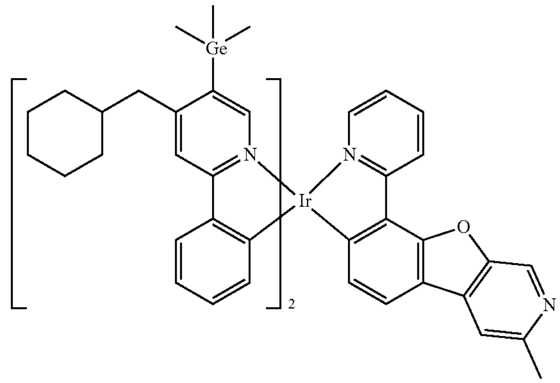
852
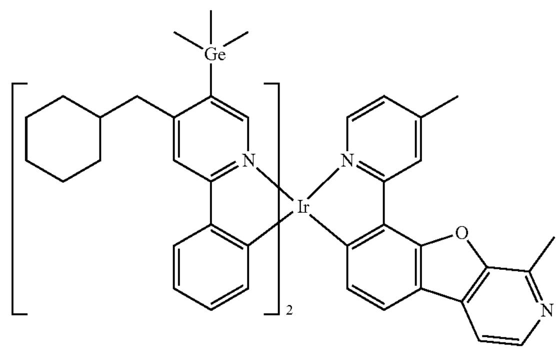
853
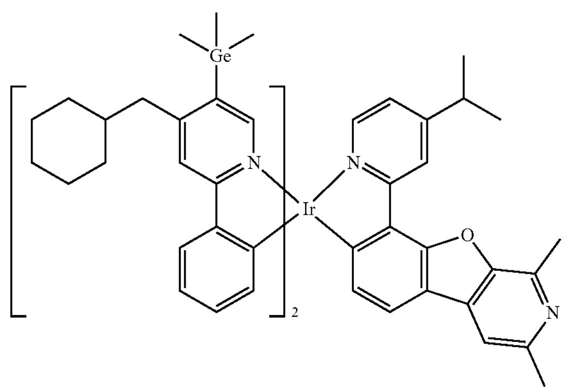
854
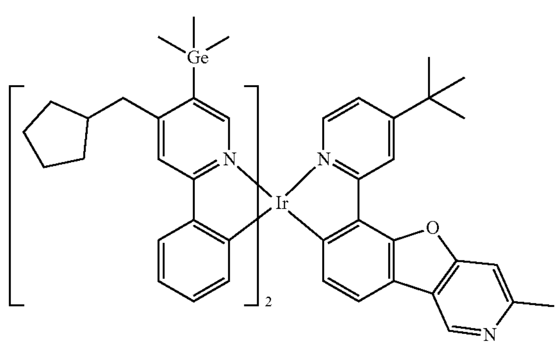

-continued
855
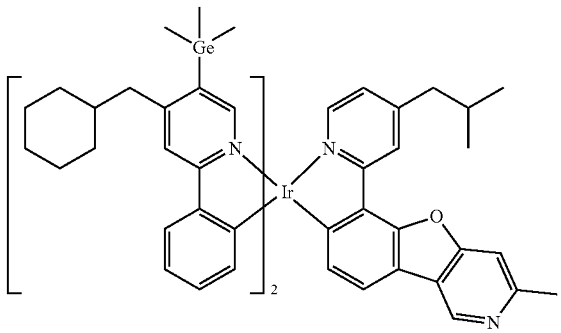
856
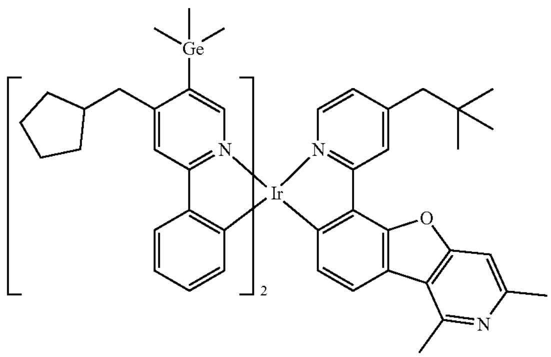
857
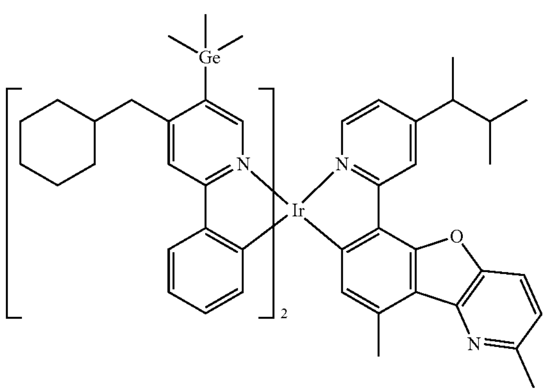
858
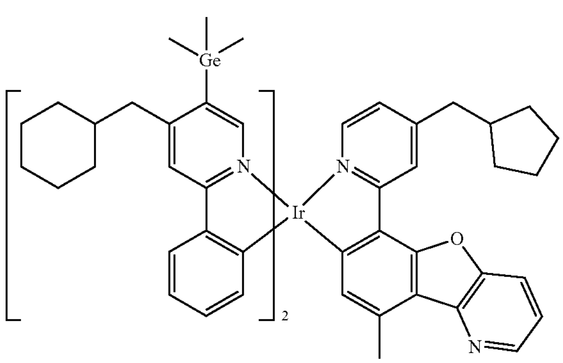
-continued
859
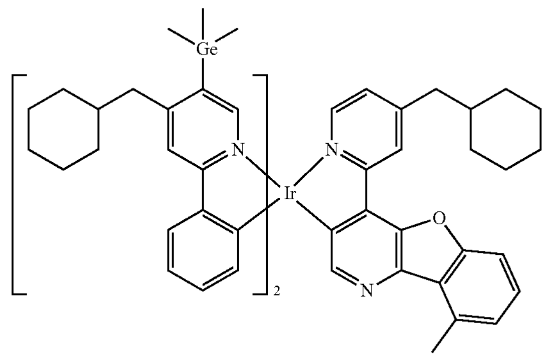
860
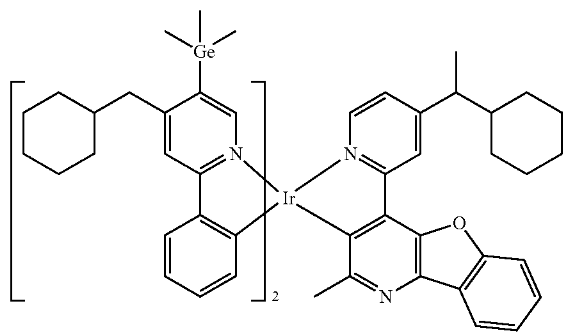
861
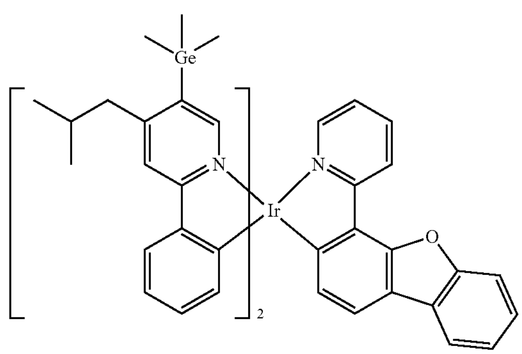
862
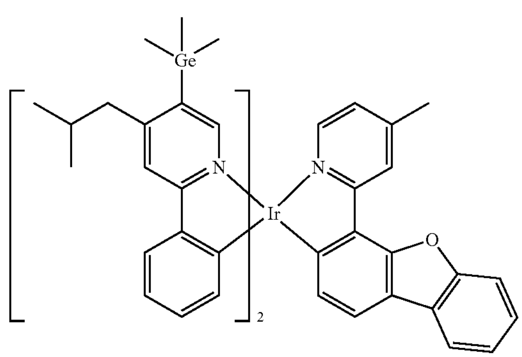

-continued
863
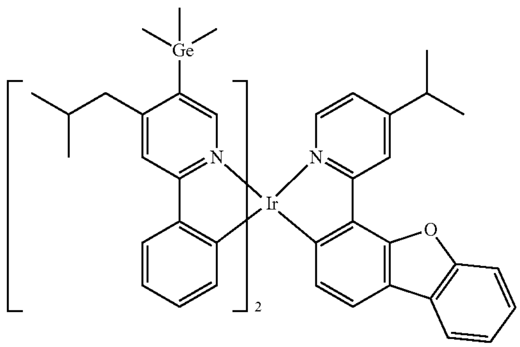
864
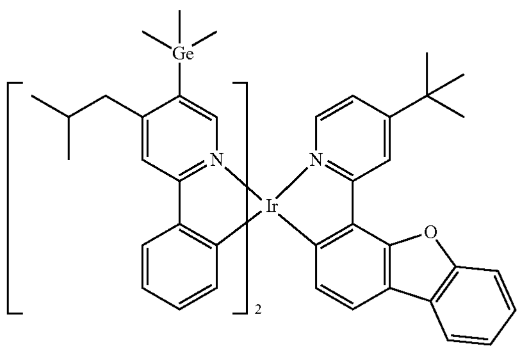
865
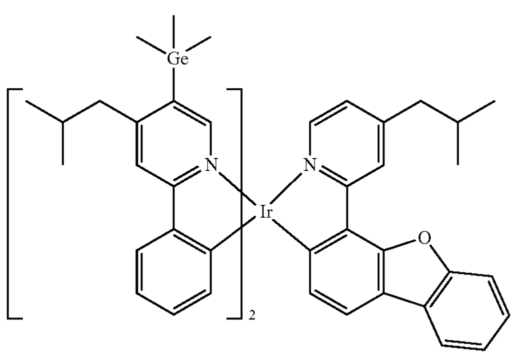
866
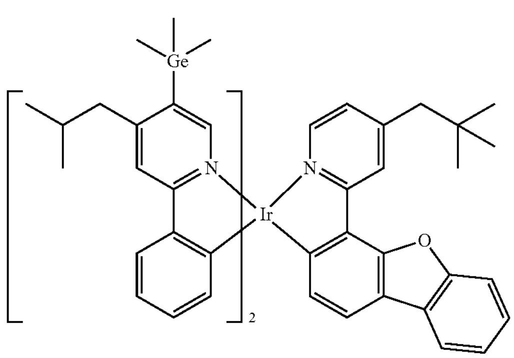
-continued
867
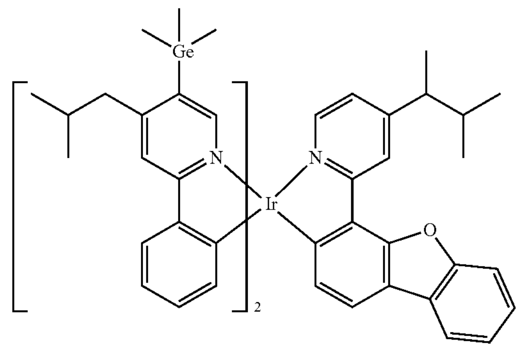
868
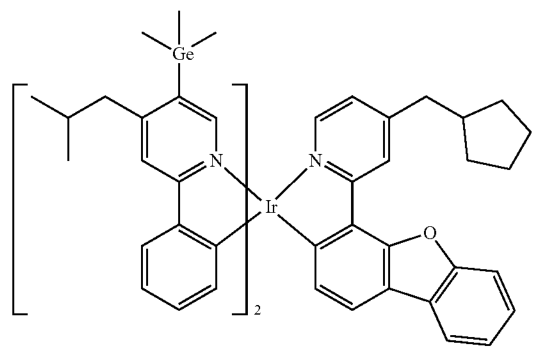
869
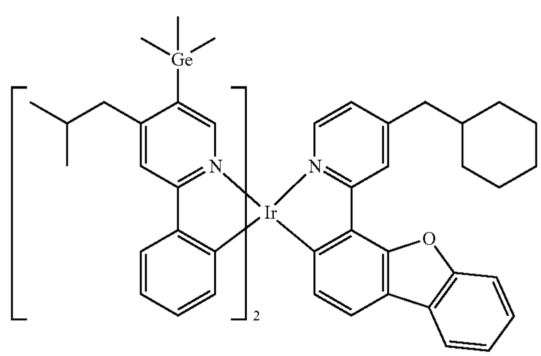
870
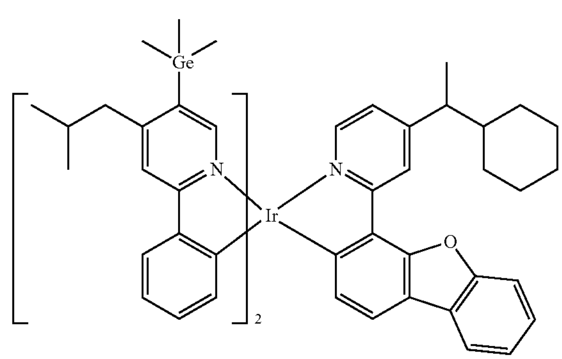

-continued
871
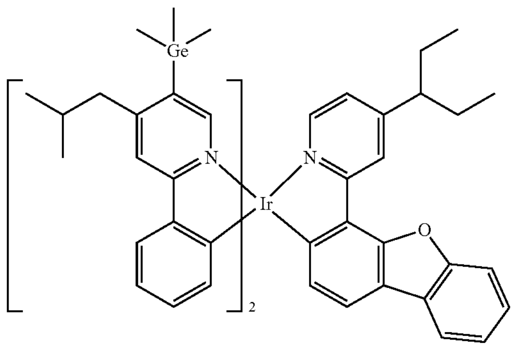
872
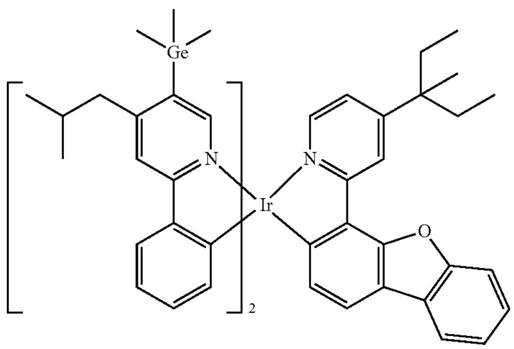
873
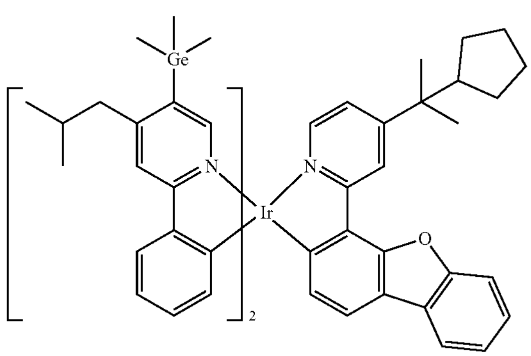
874
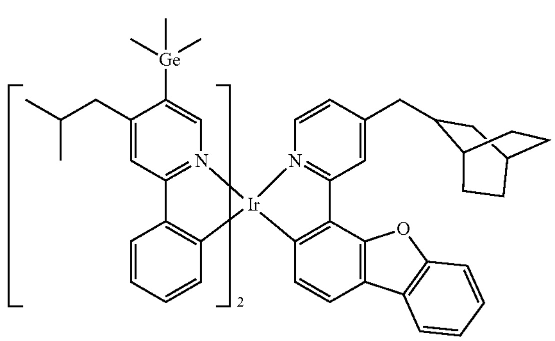
-continued
875
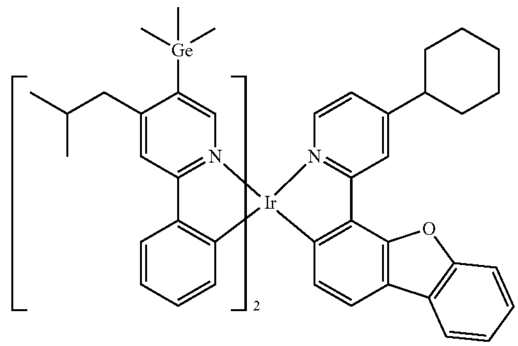
876
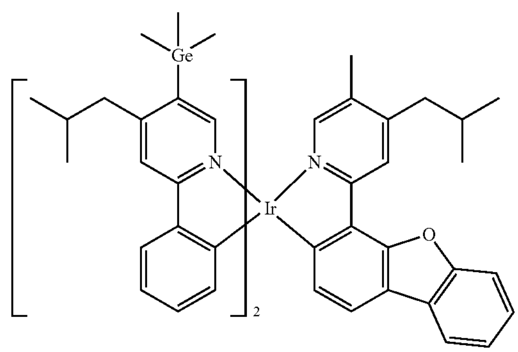
877
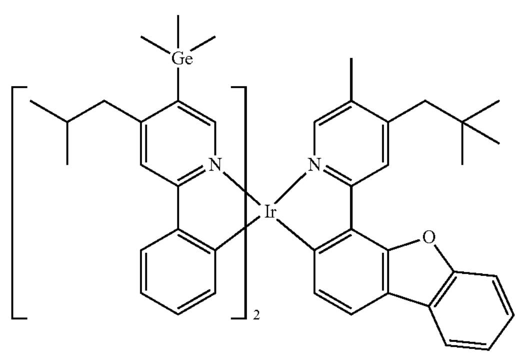
878
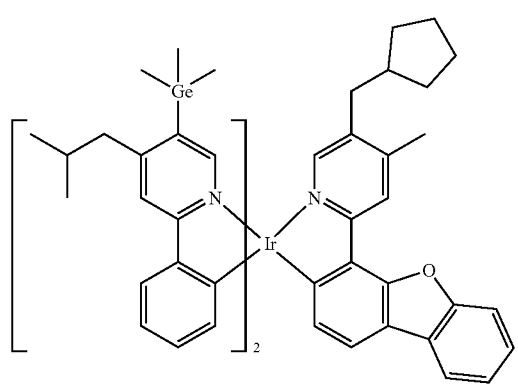

-continued
879
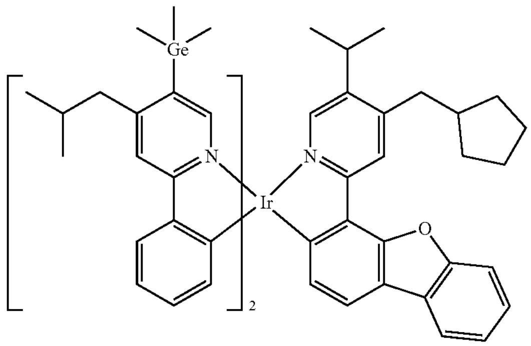
880
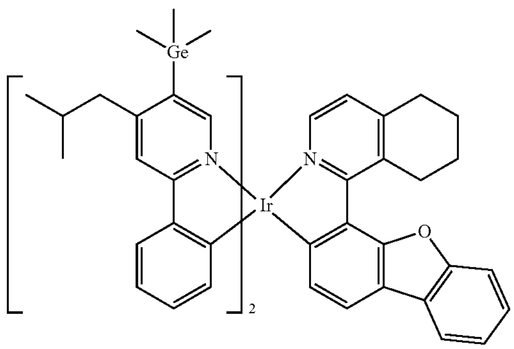
881
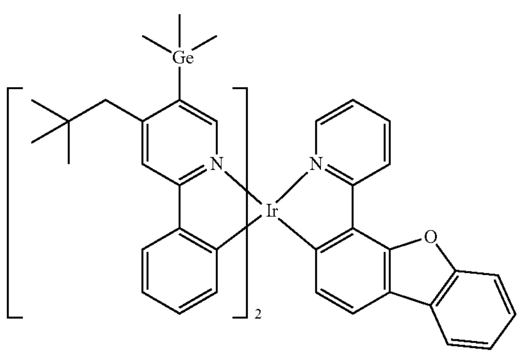
882
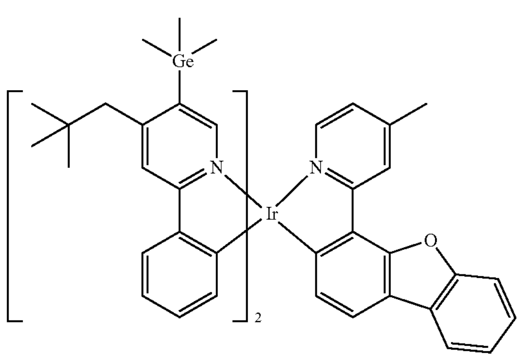
-continued
883
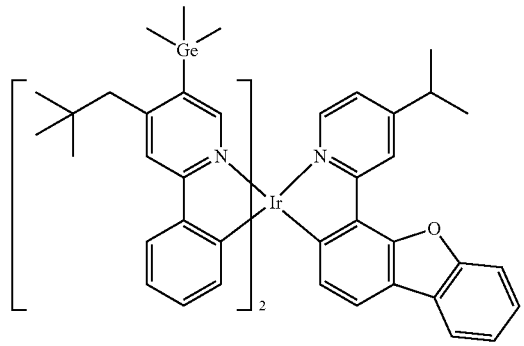
884
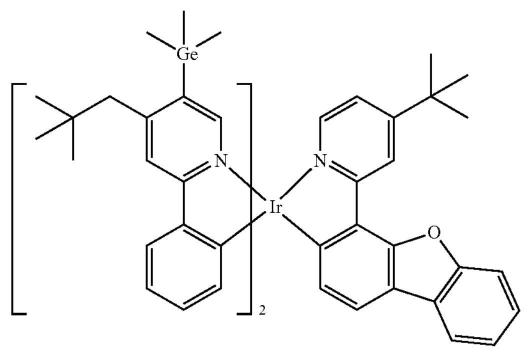
885
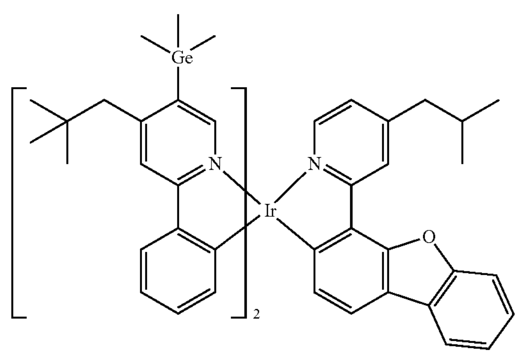
886
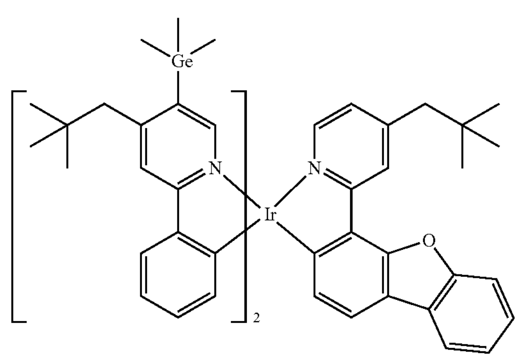

-continued
887
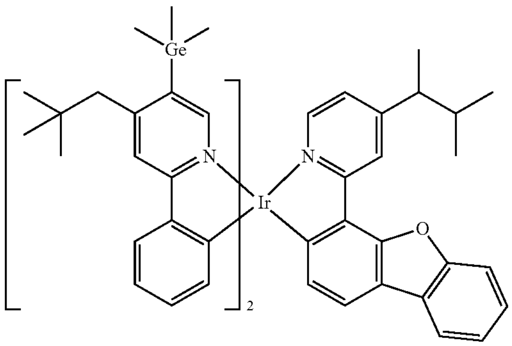
888
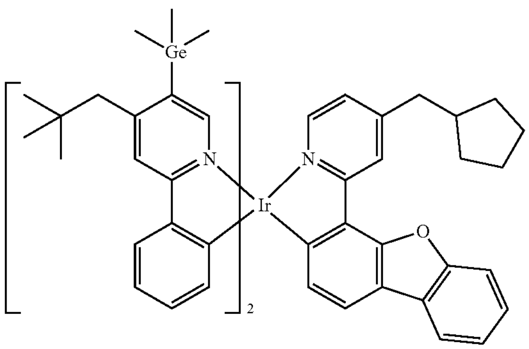
889
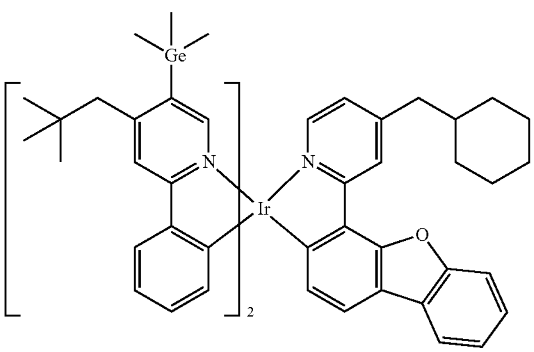
890
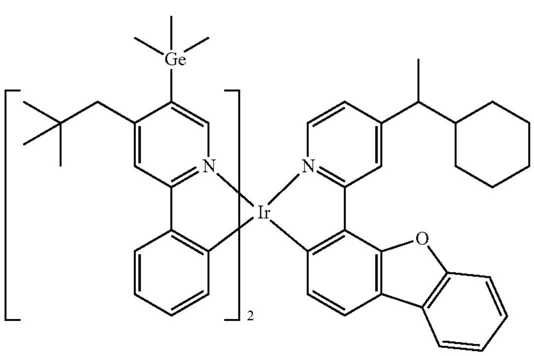
-continued
891
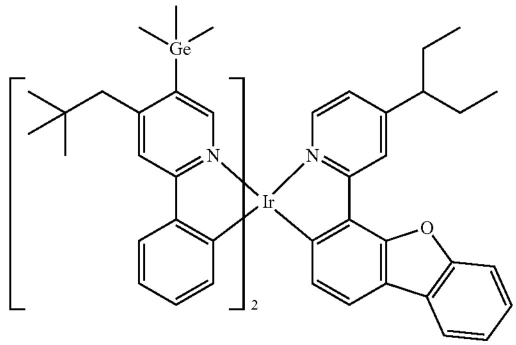
892
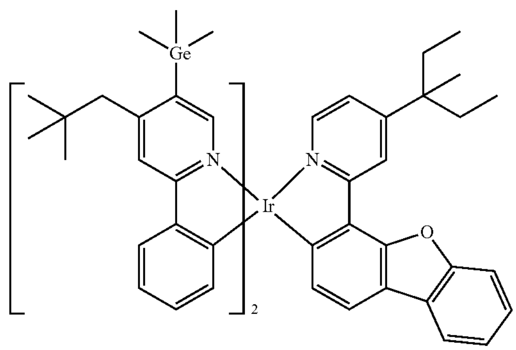
893
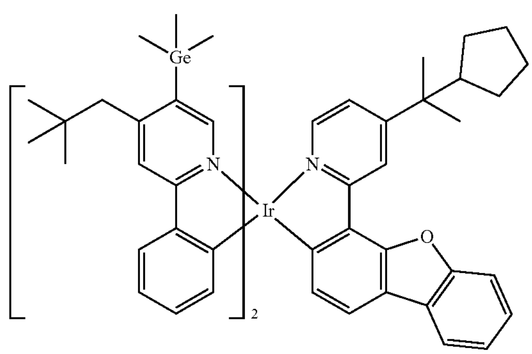
894
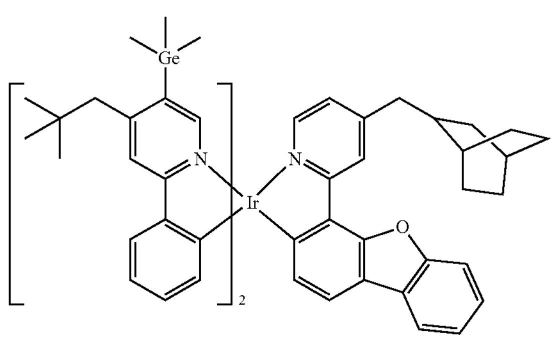

-continued
895
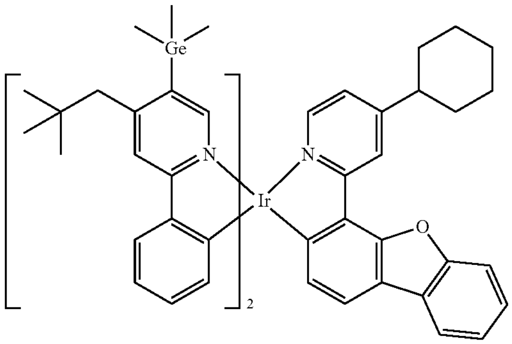
896
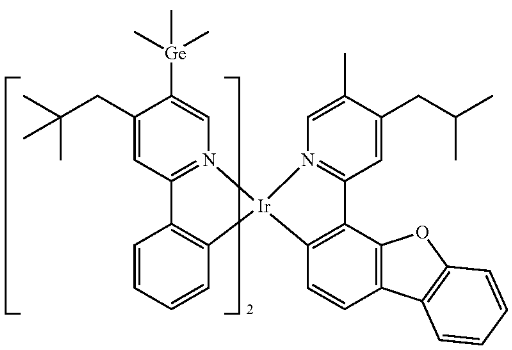
897
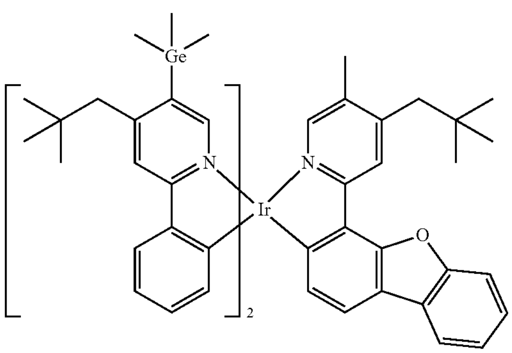
898
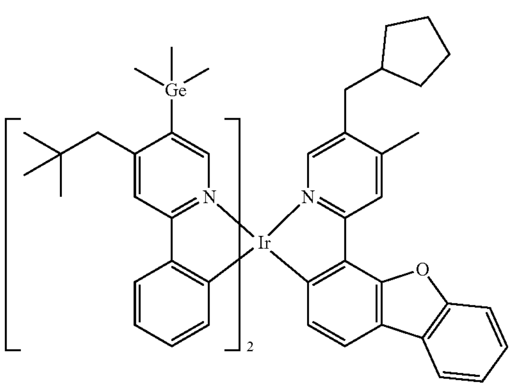
-continued
899
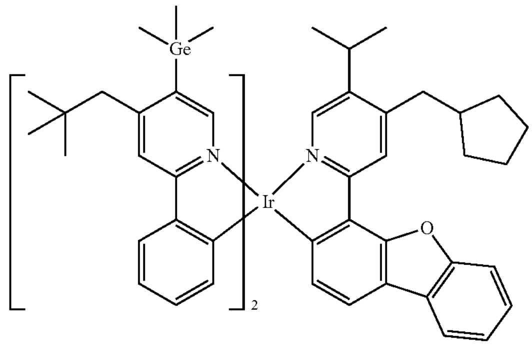
900
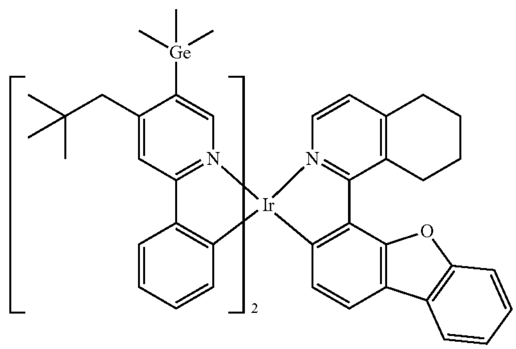
901
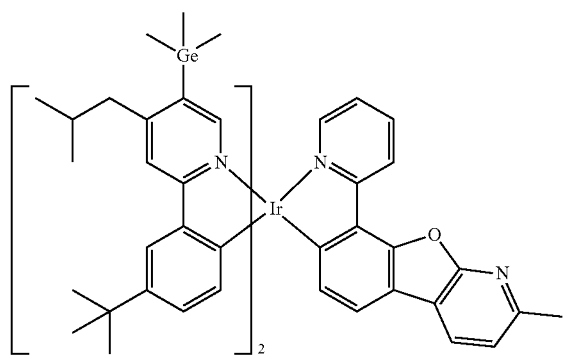
902
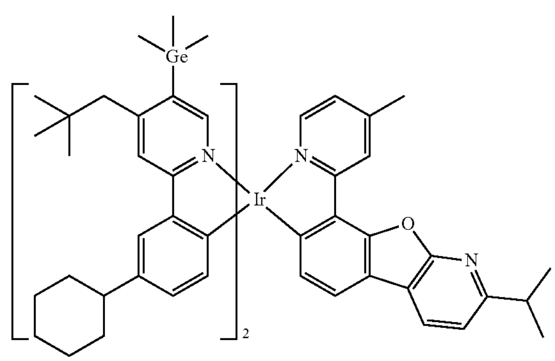

903
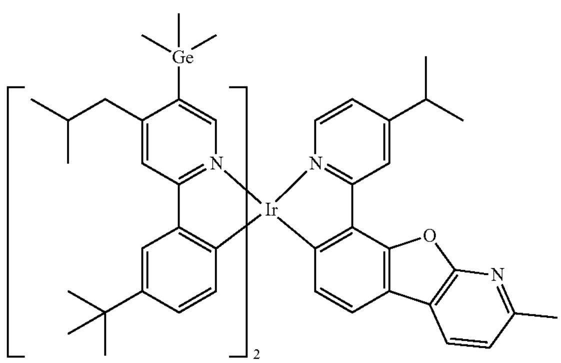
904
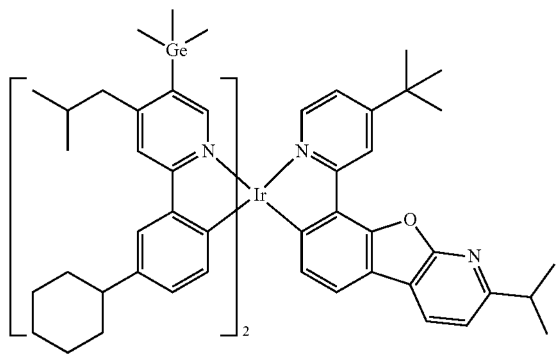
905
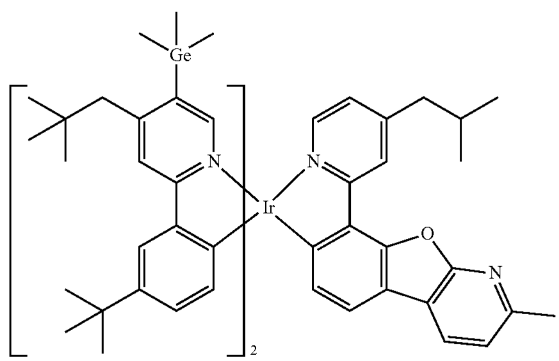
906
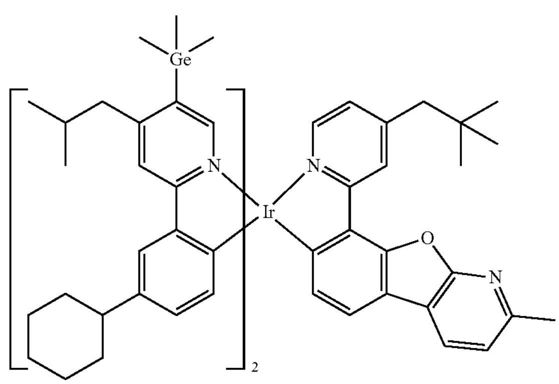
907
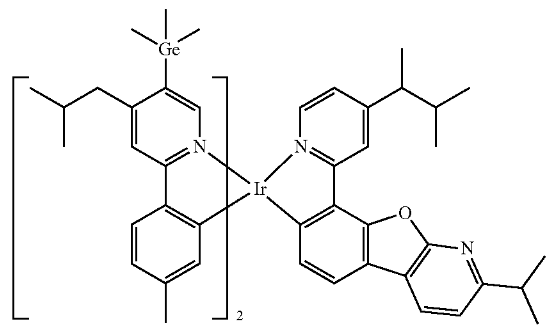
908
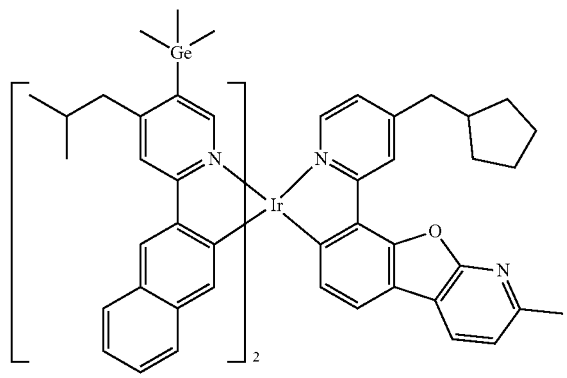
909
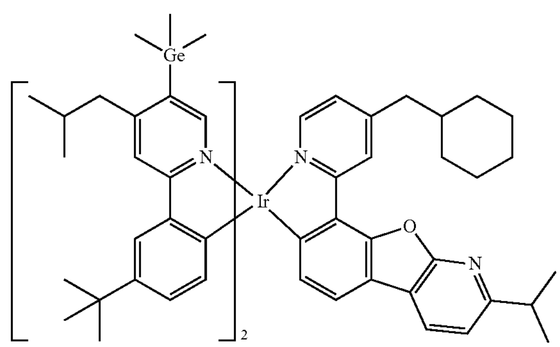
910
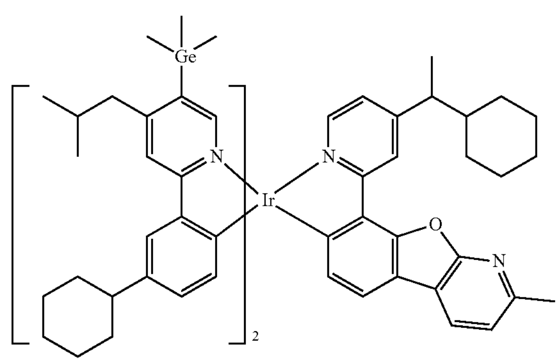

-continued
911
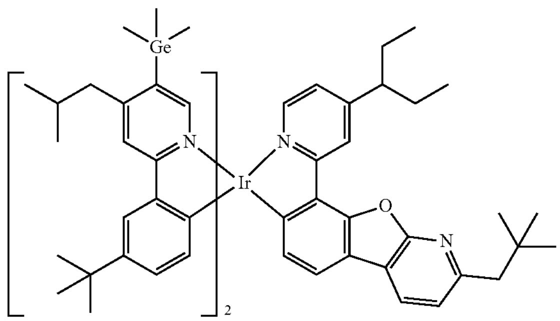
912
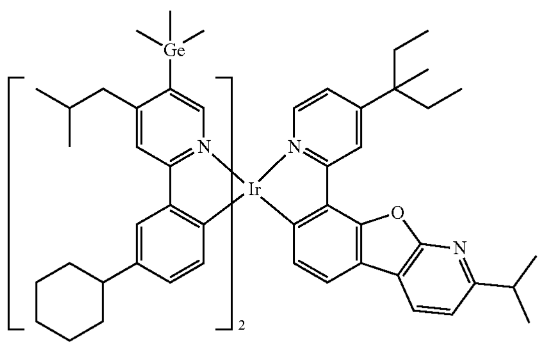
913
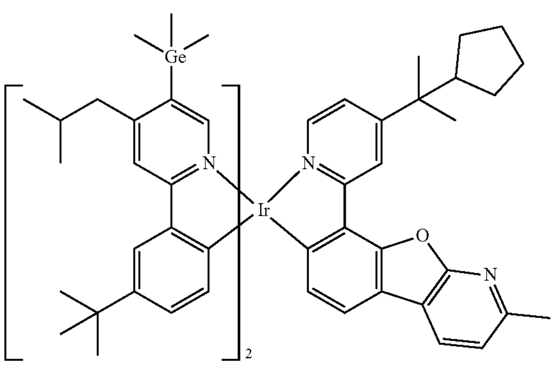
914
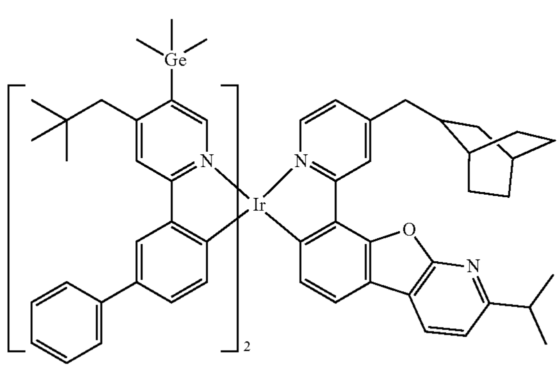
-continued
915
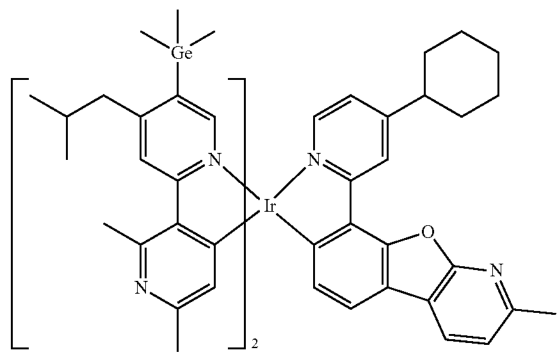
916
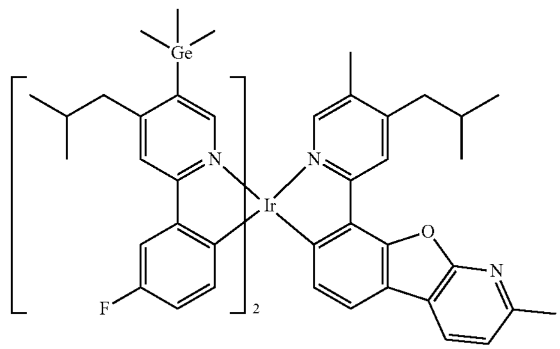
917
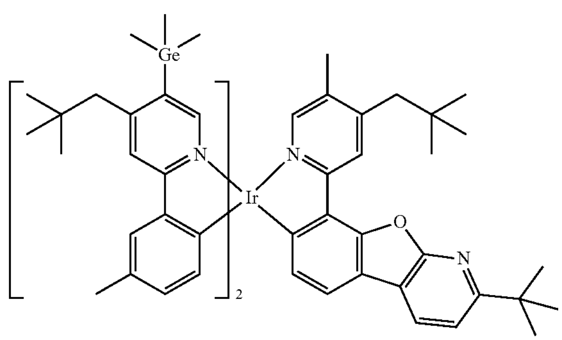
918
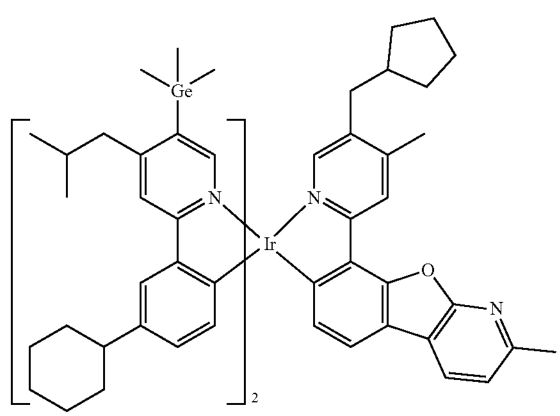

919
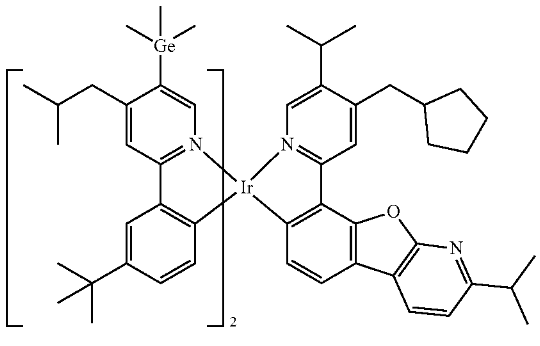
920
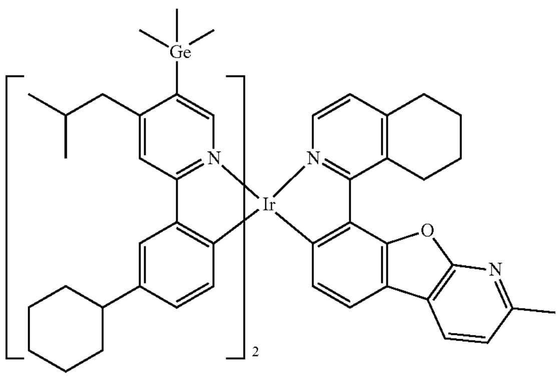
921
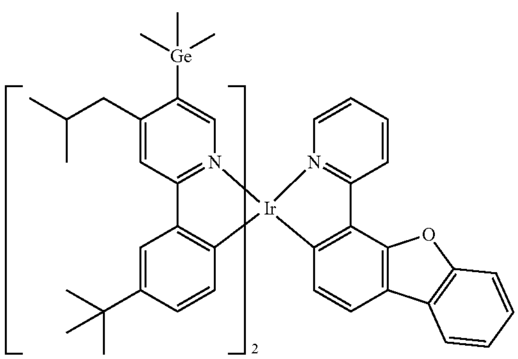
922
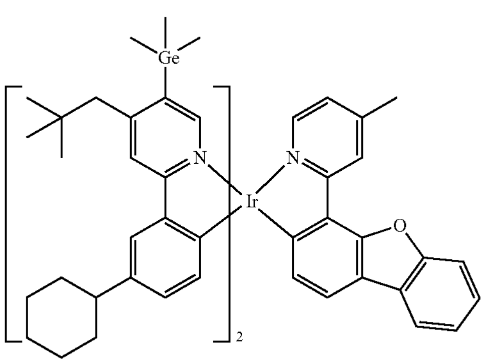
923
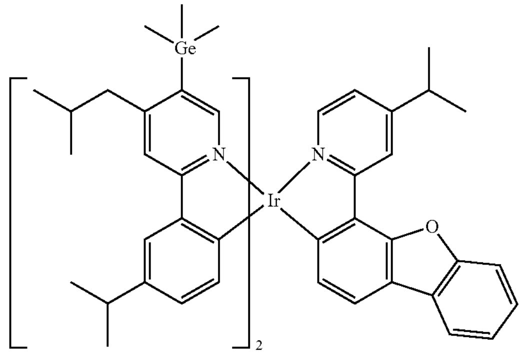
924
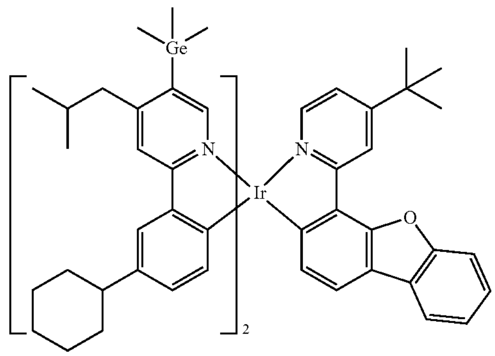
925
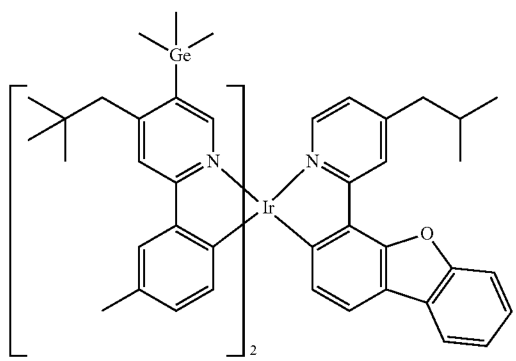
926
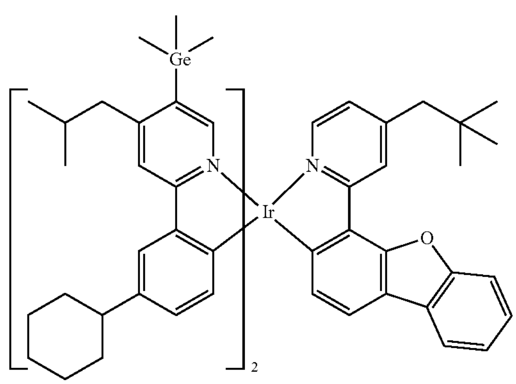

-continued
927
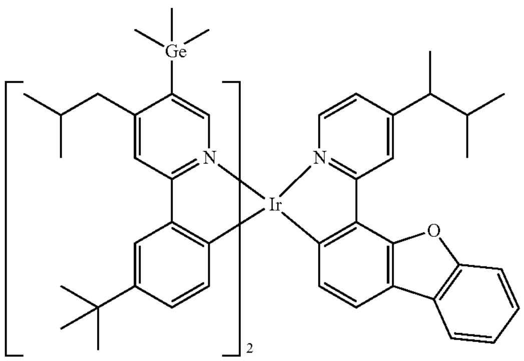
928
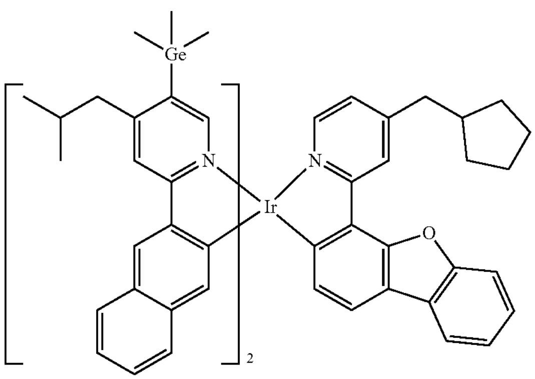
929
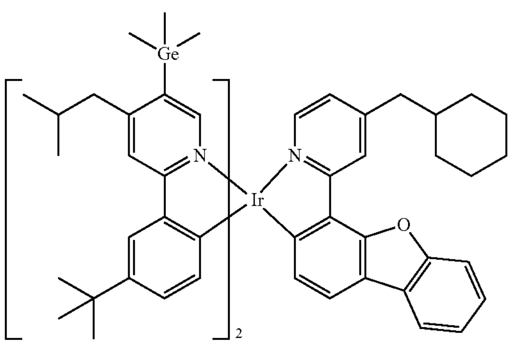
930
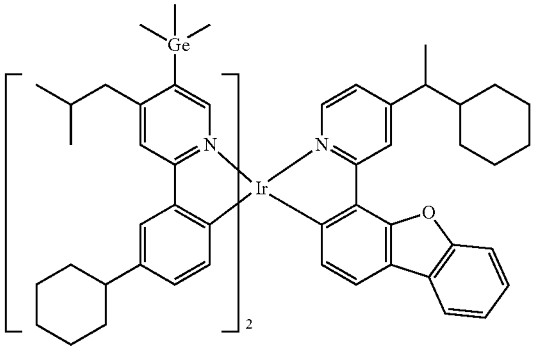
-continued
931
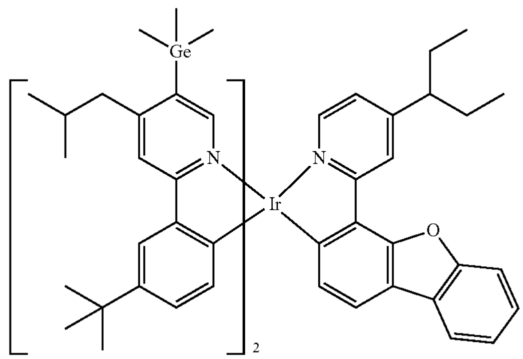
932
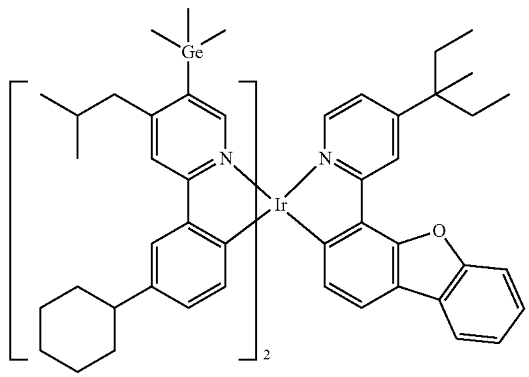
933
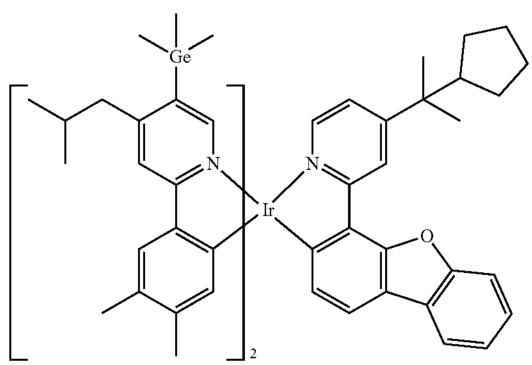
934
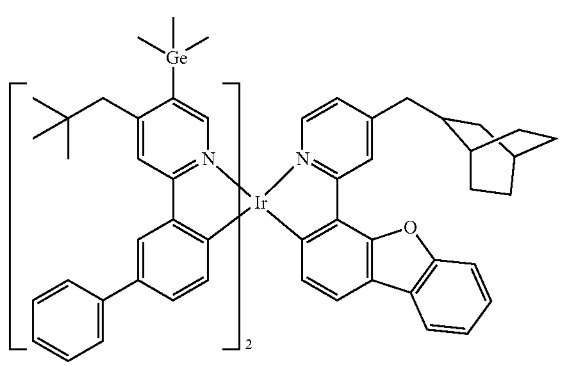

-continued
935
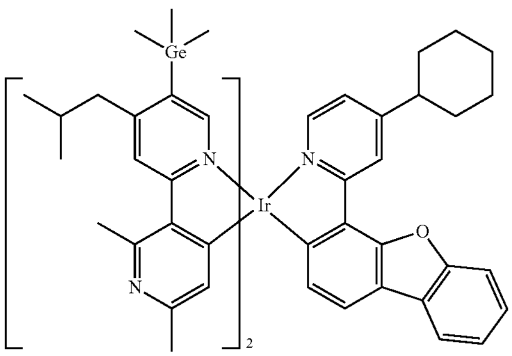
936
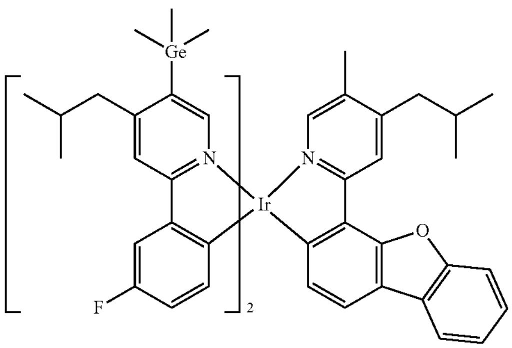
937
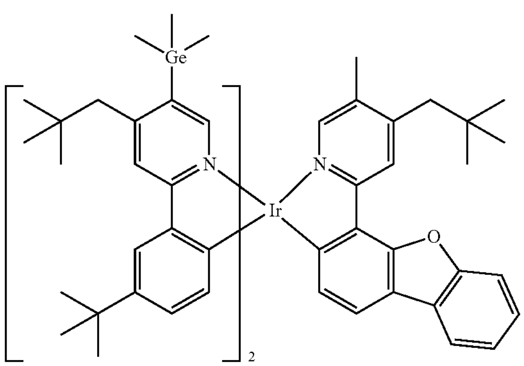
938
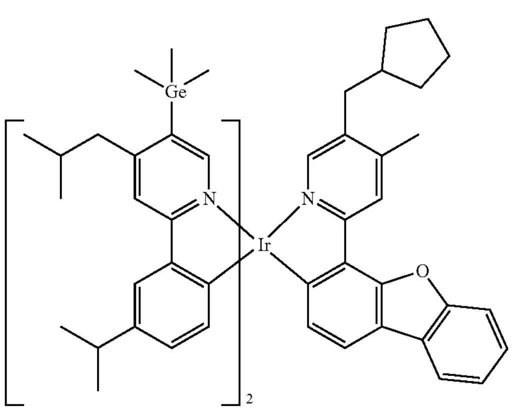
-continued
939
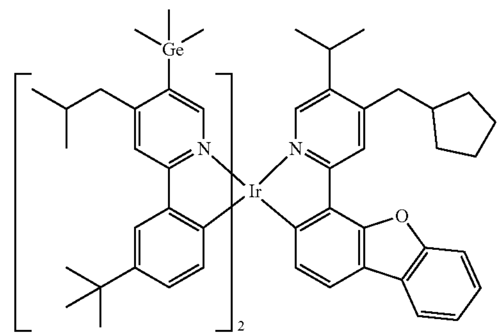
940
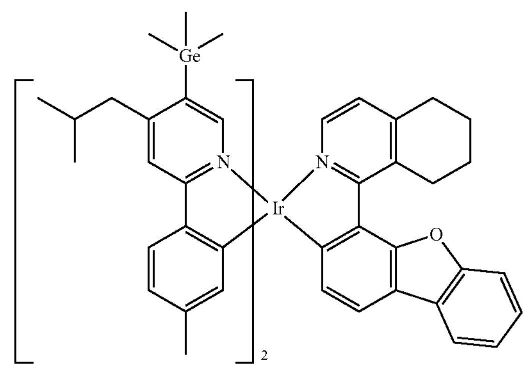
941
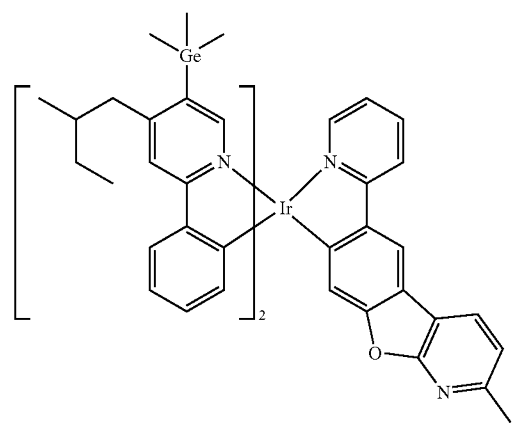
942
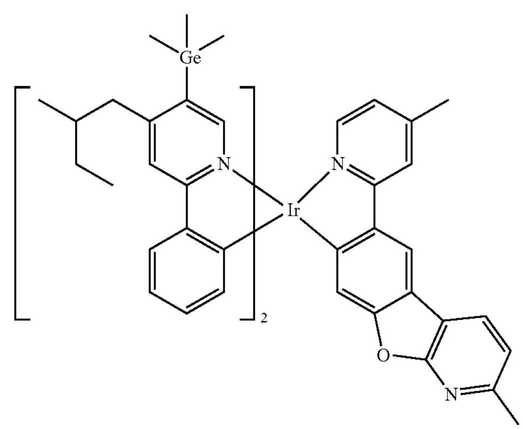

-continued
943
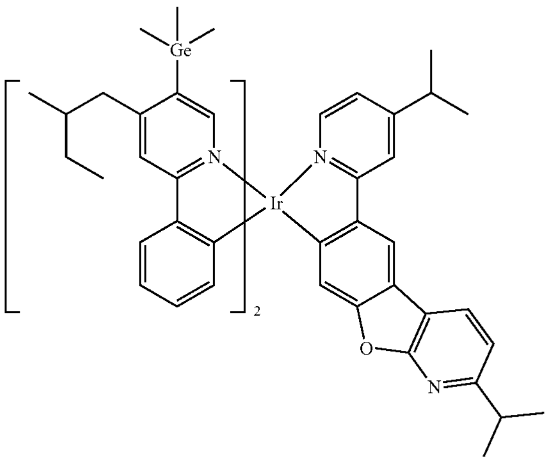
944
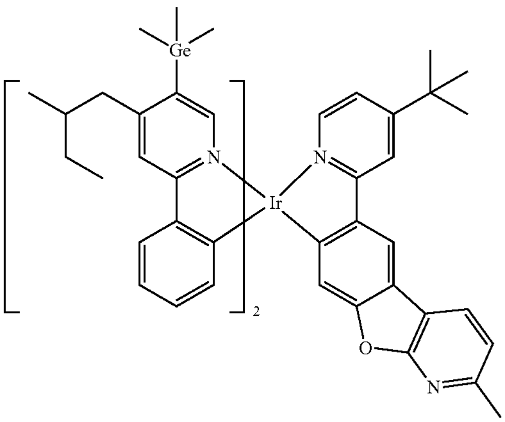
945
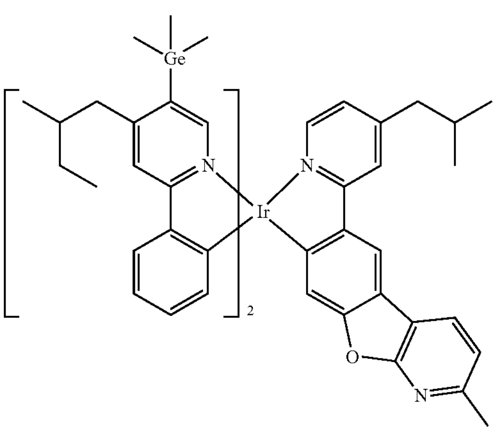
-continued
946
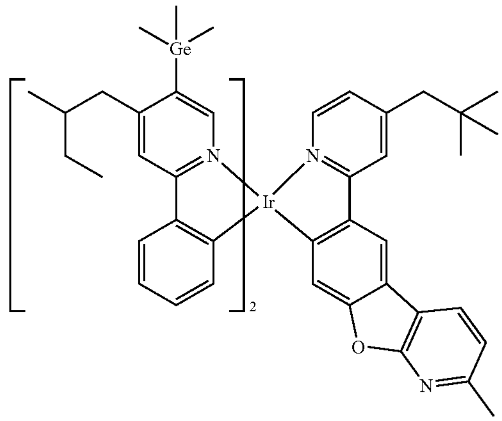
947
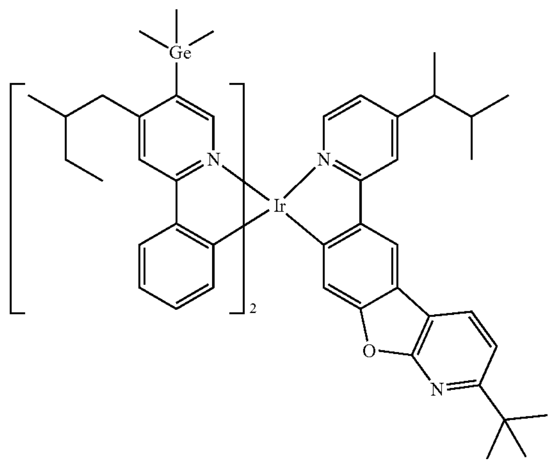
948
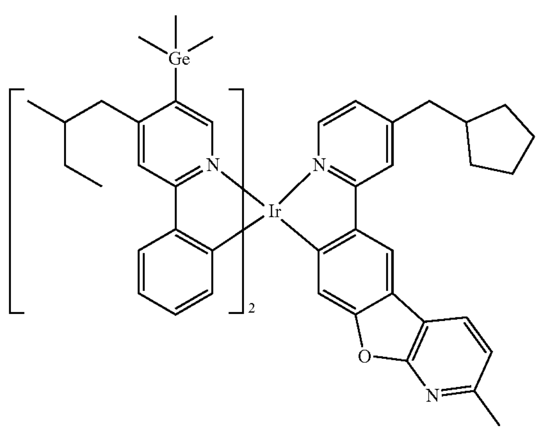

-continued
949
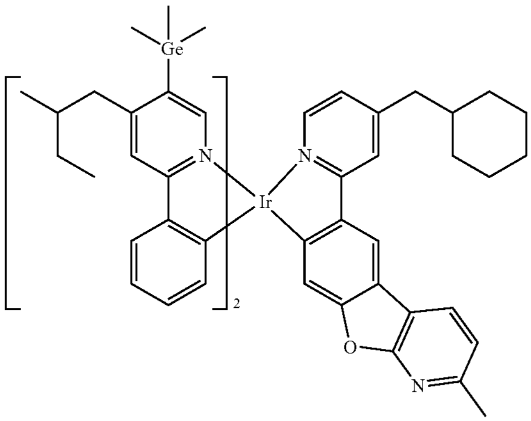
950
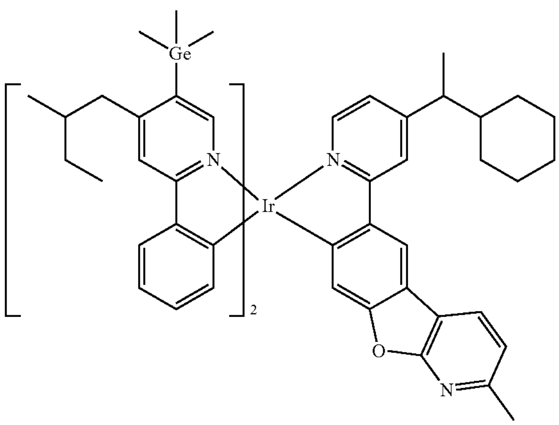
951
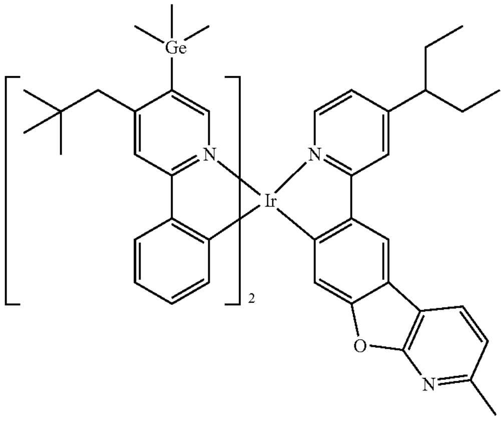
-continued
952
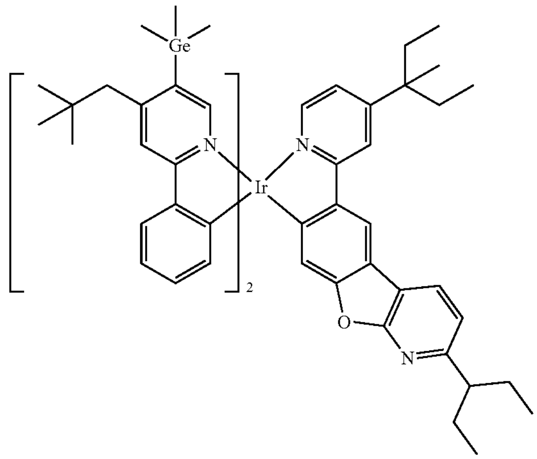
953
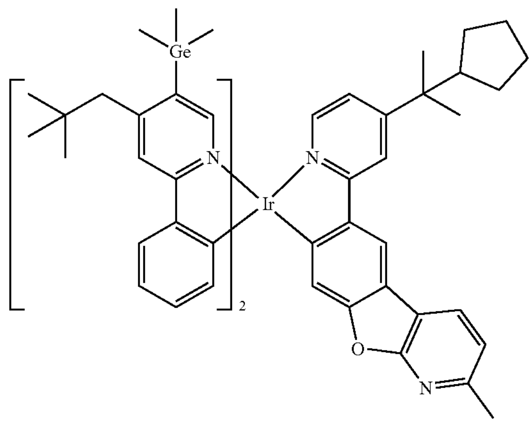
954
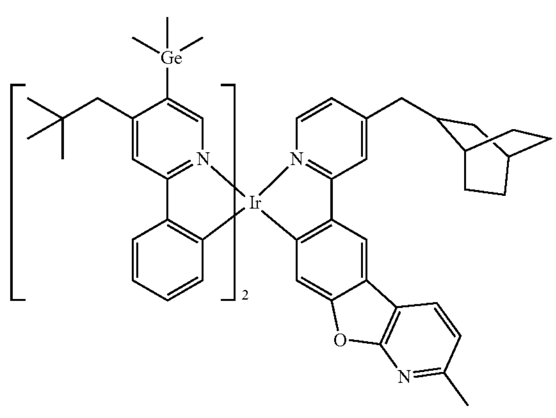

-continued
955
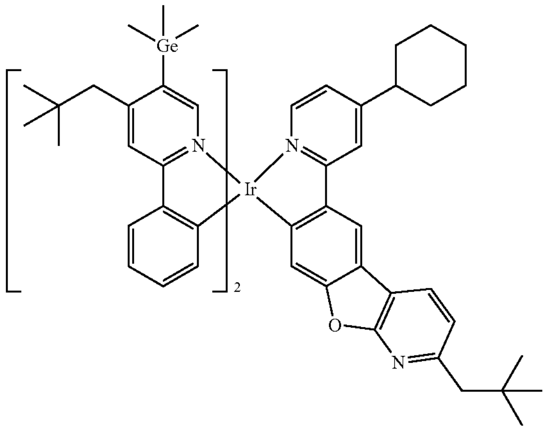
956
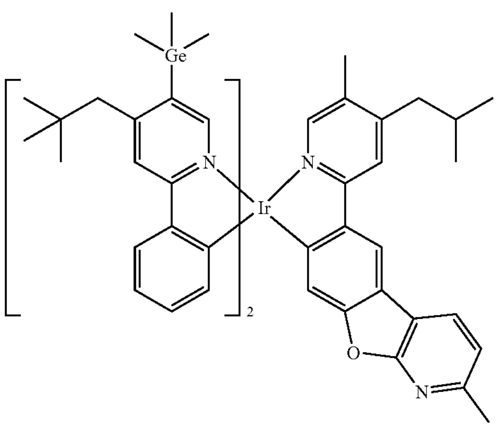
957
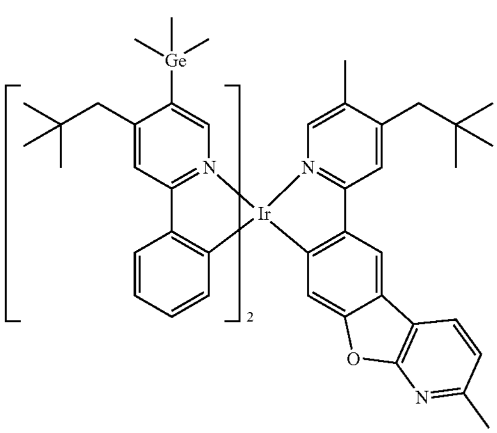
-continued
958
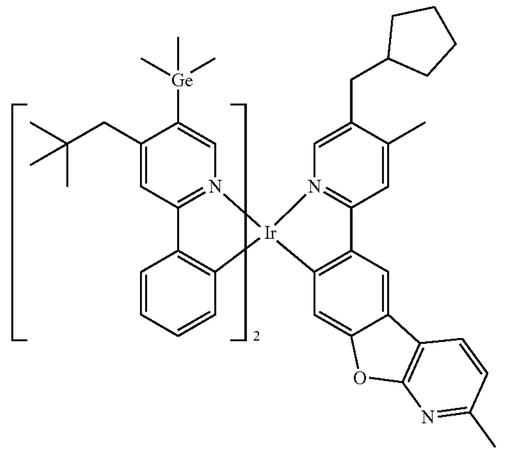
959
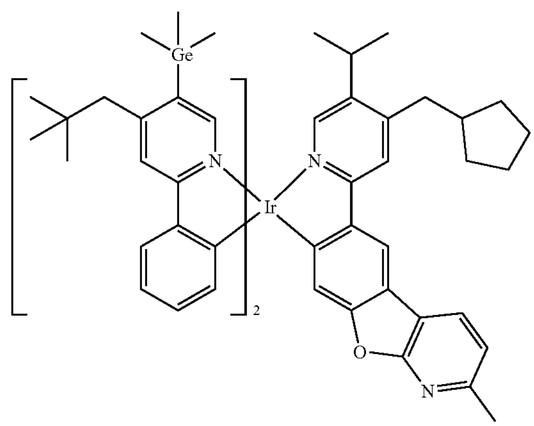
960
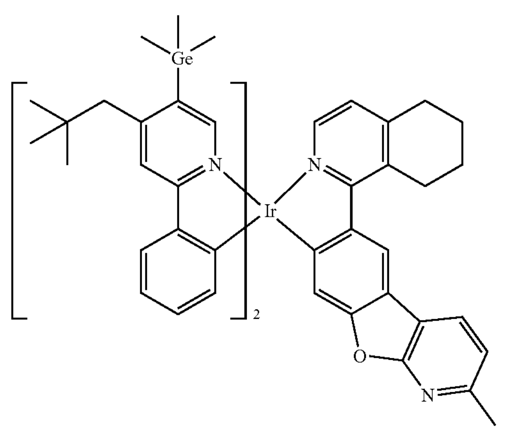

-continued
961
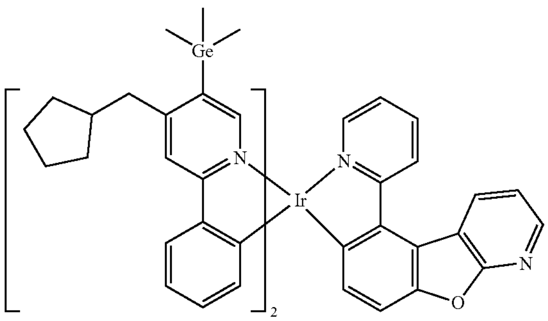
962
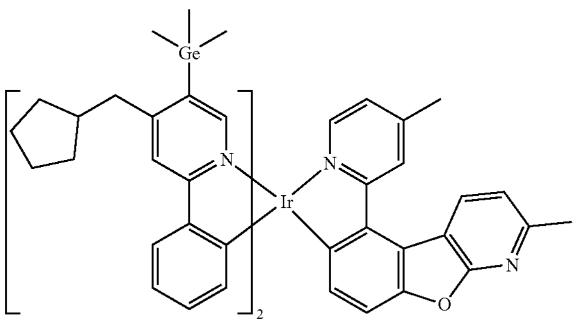
963
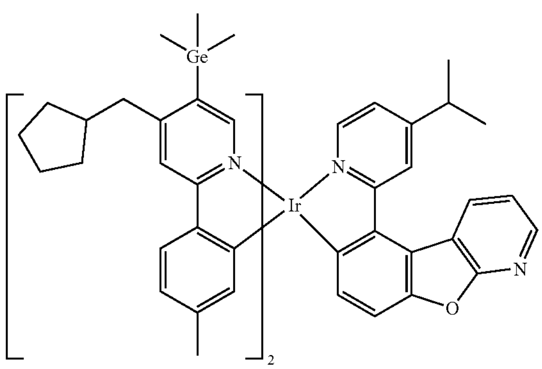
964
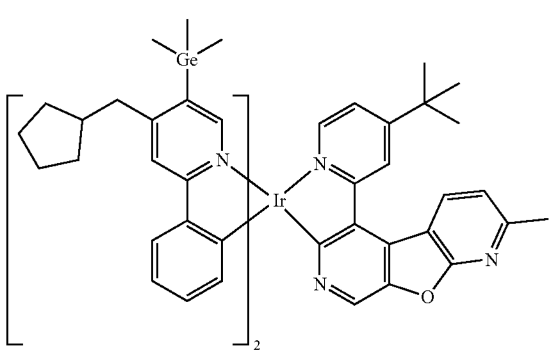
965
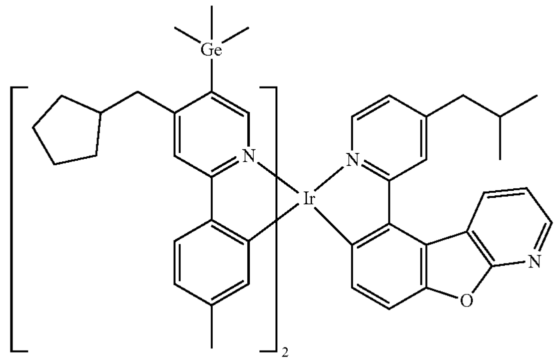
966
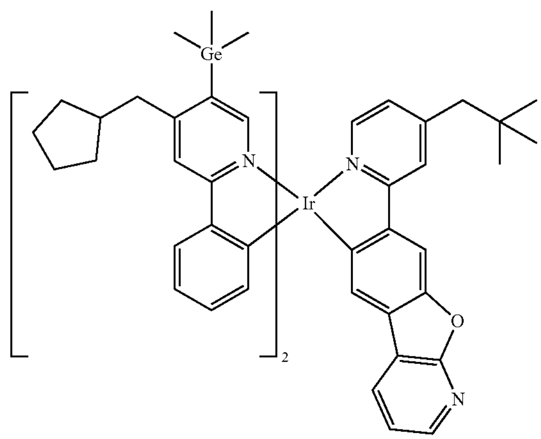
967
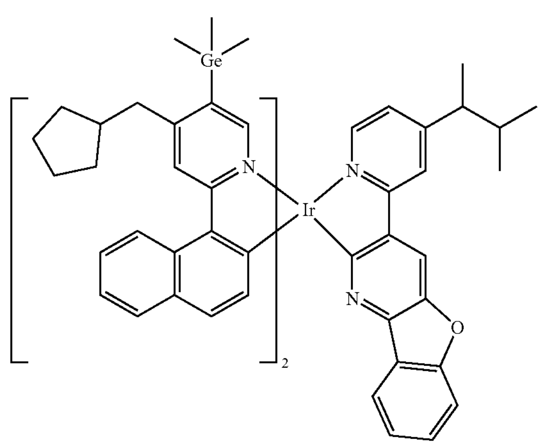

-continued
968
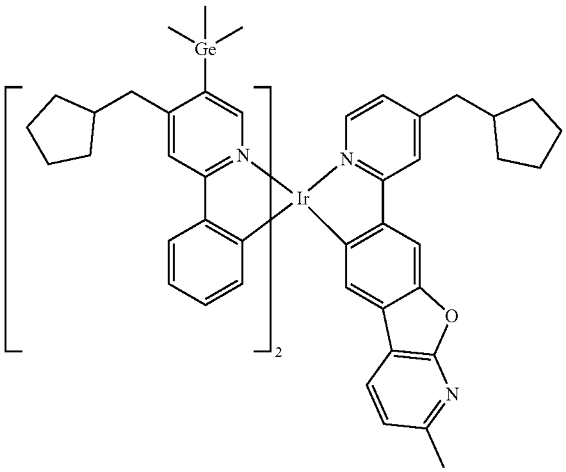
969
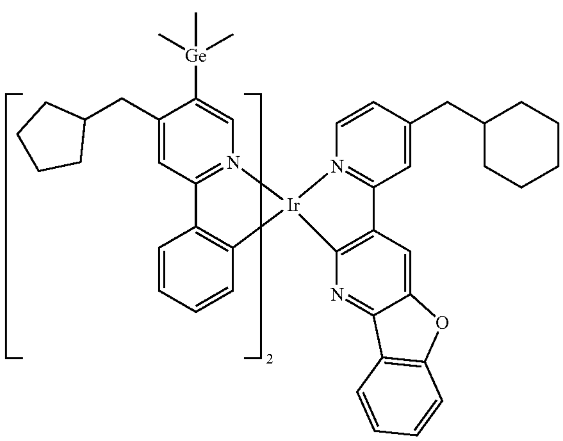
970
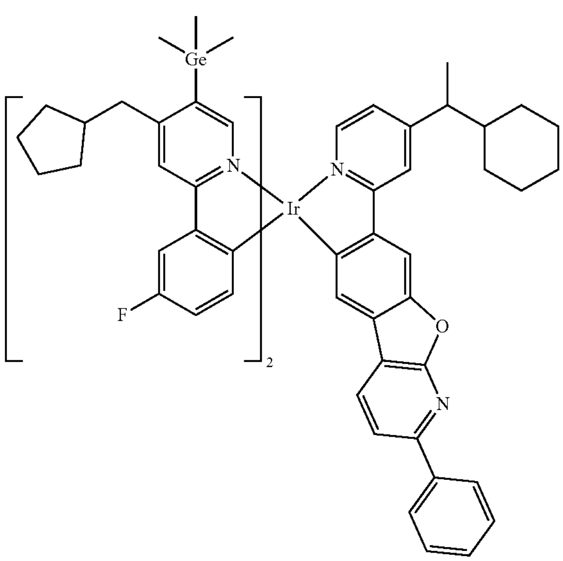
-continued
971
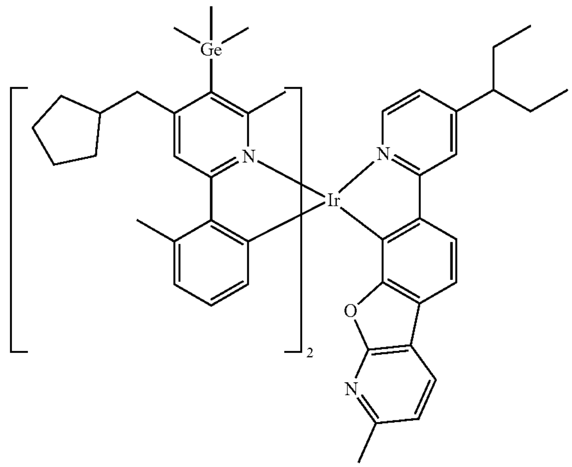
972
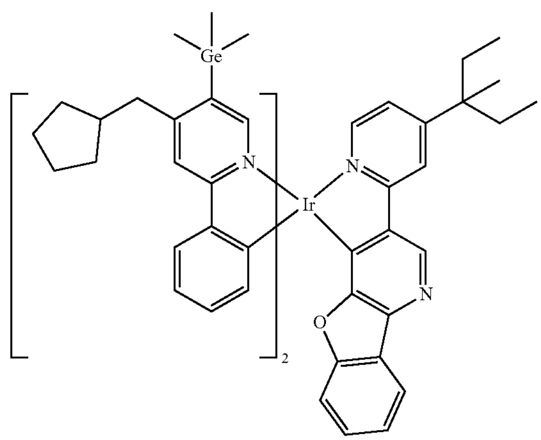
973
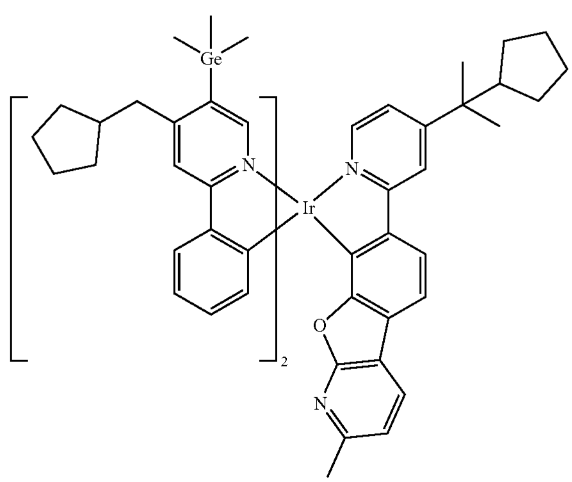

974
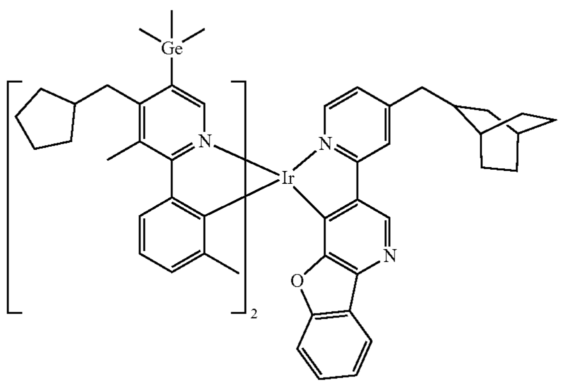
975
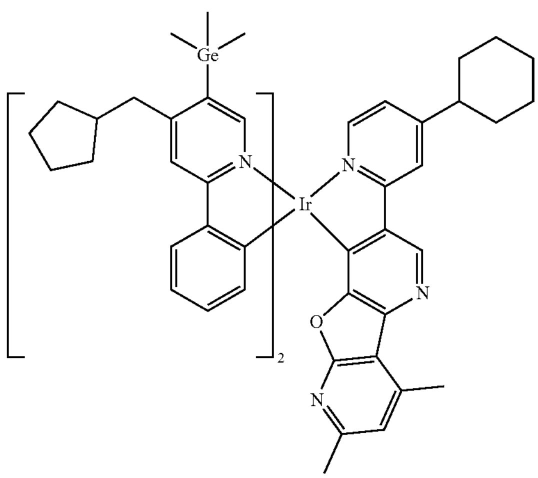
976
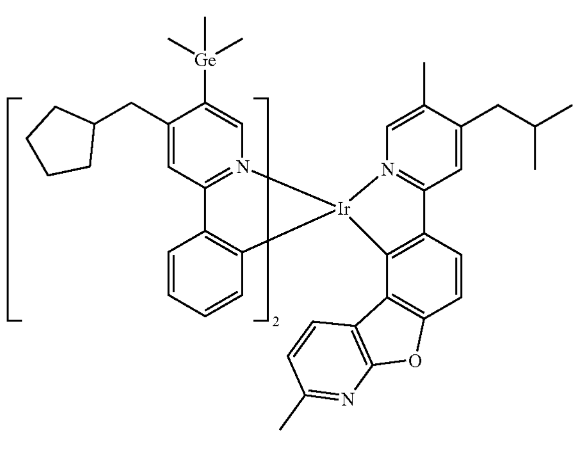
977
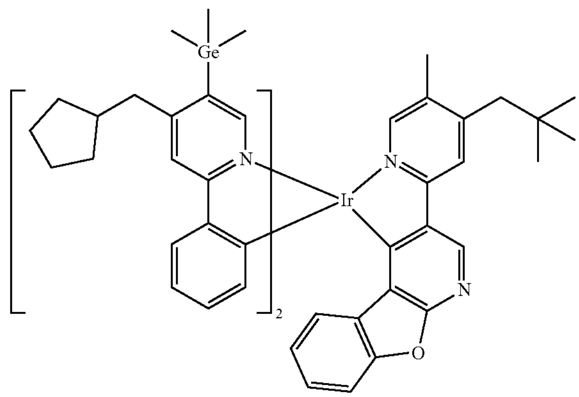
978
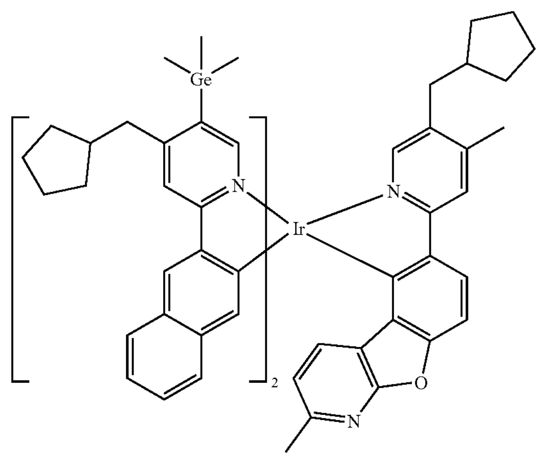
979
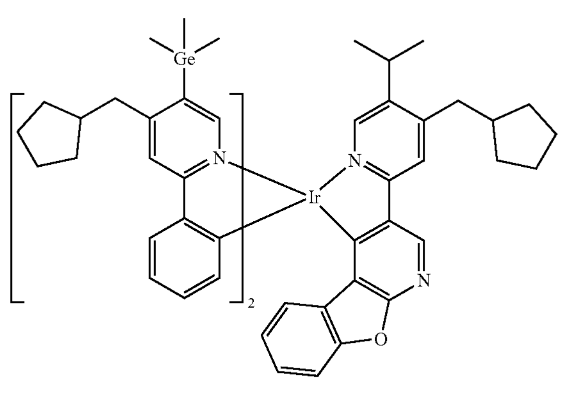

-continued
980
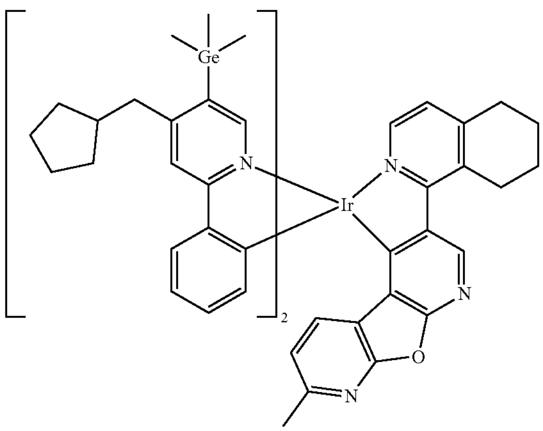
981
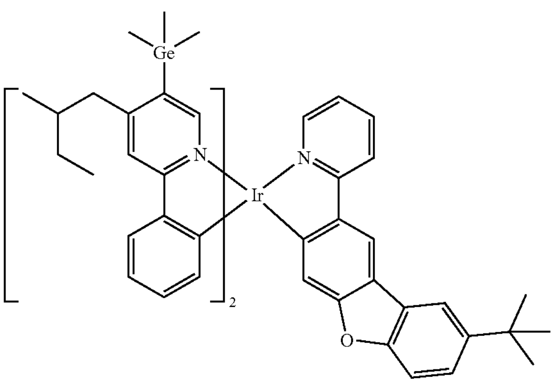
982
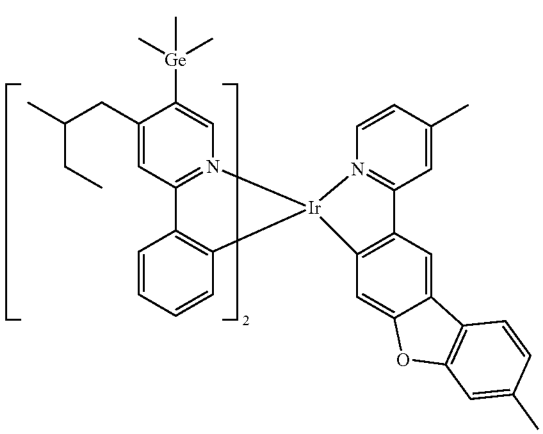
-continued
983
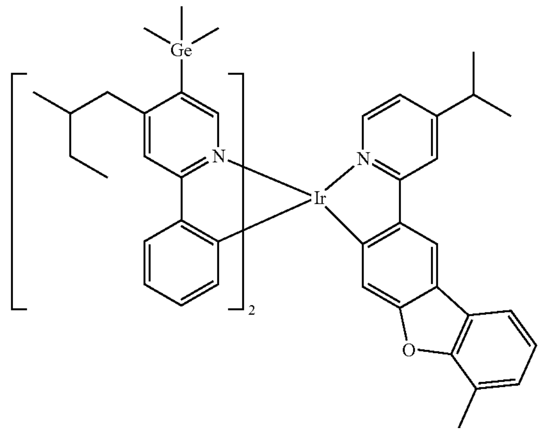
984
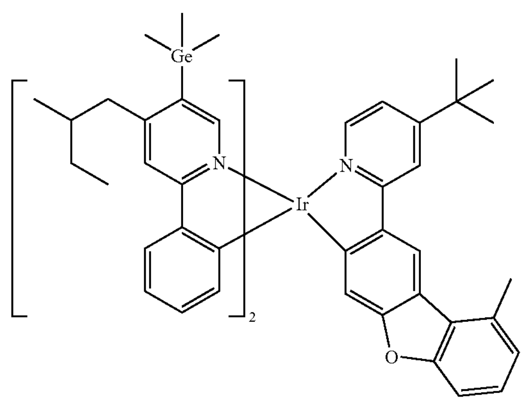
985
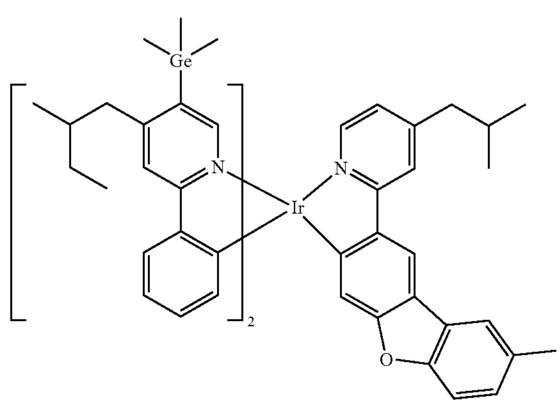

986
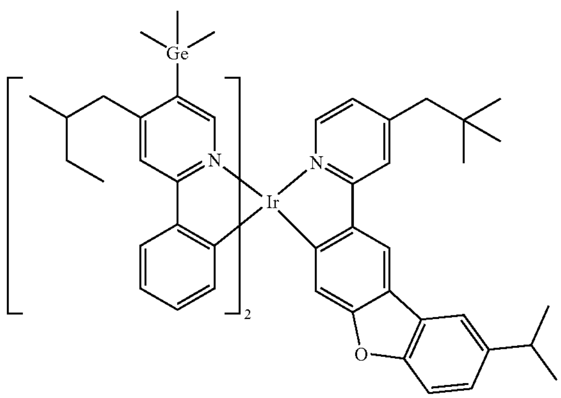
987
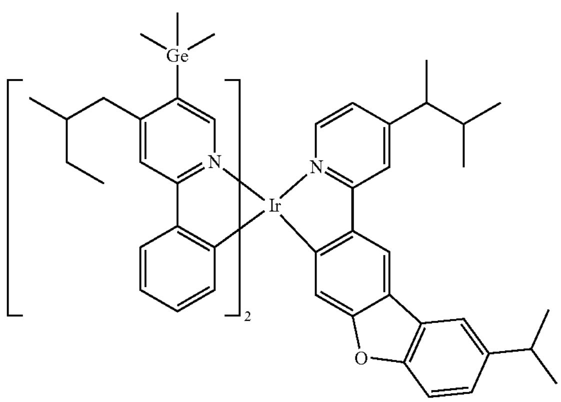
988
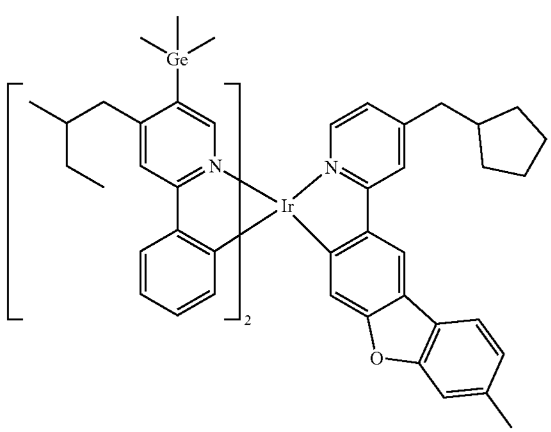
989
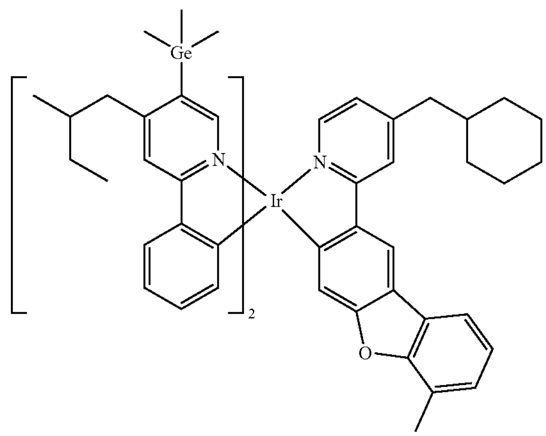
990
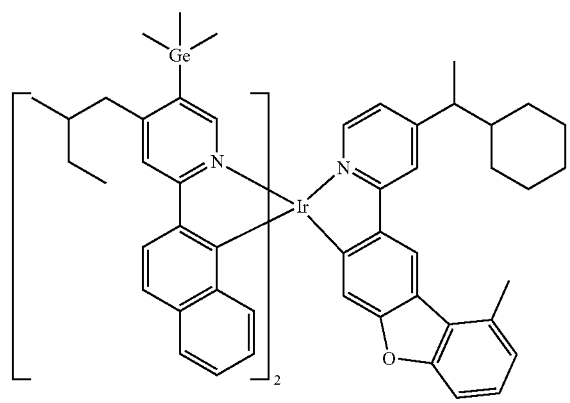
991
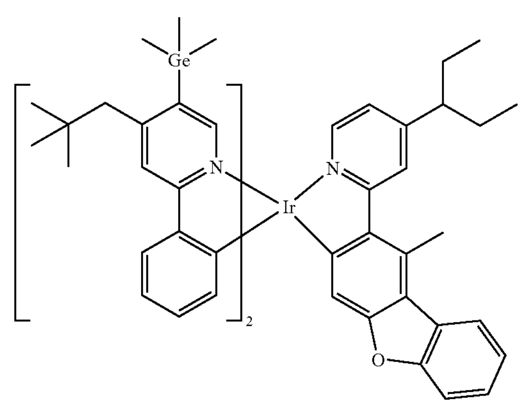

992
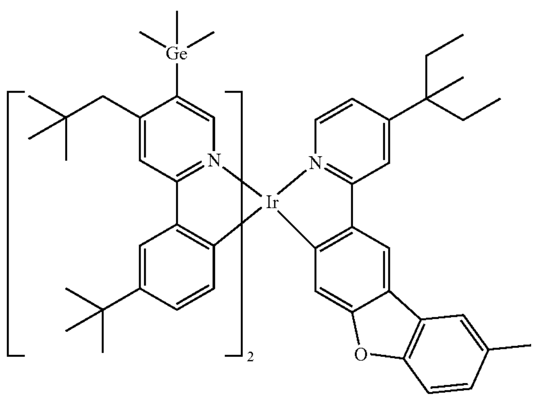
993
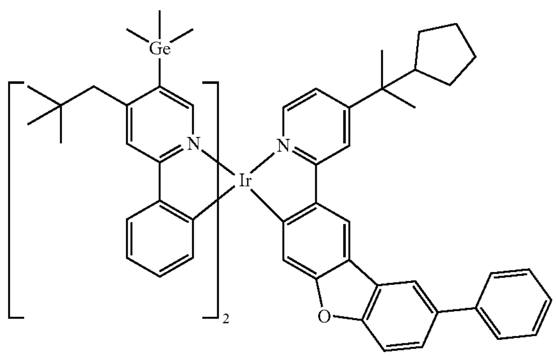
994
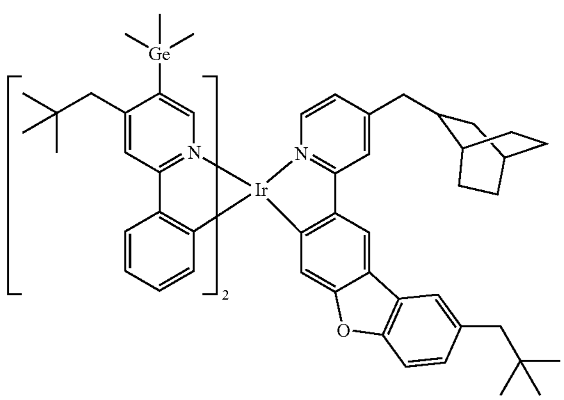
995
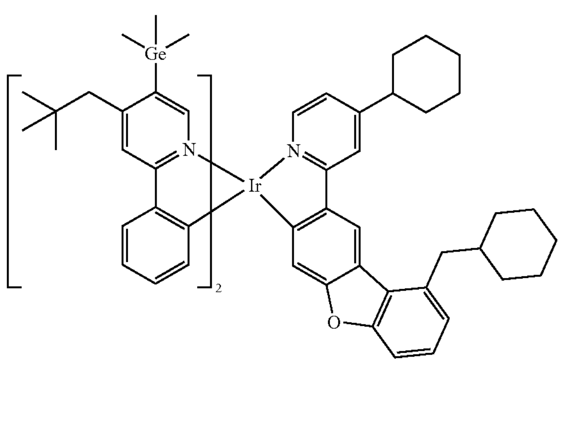
996
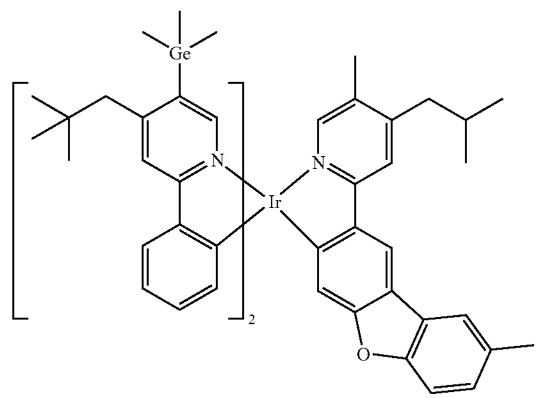
997
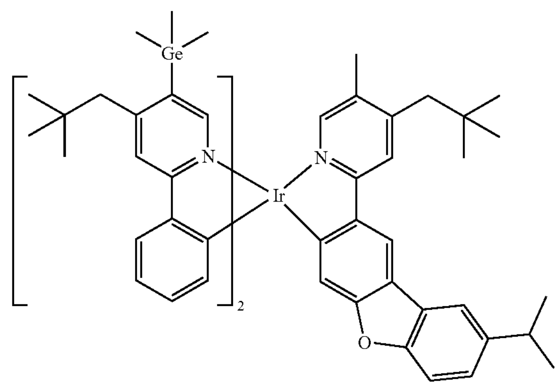
998
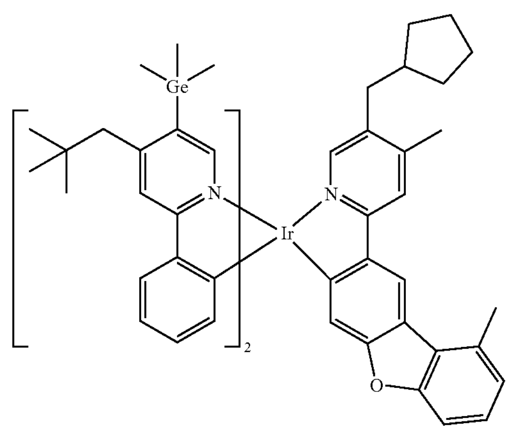
999
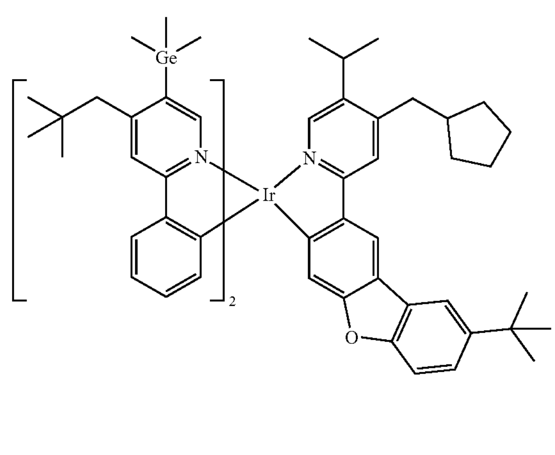

1000
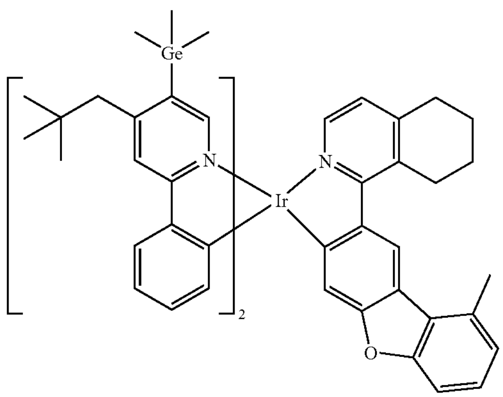
1001
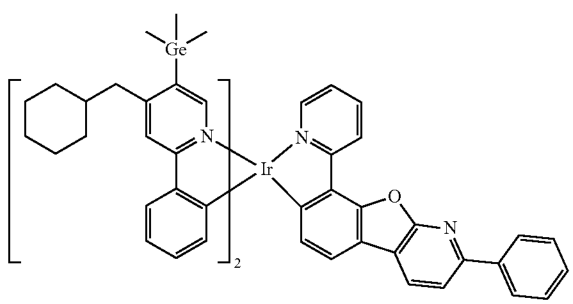
1002
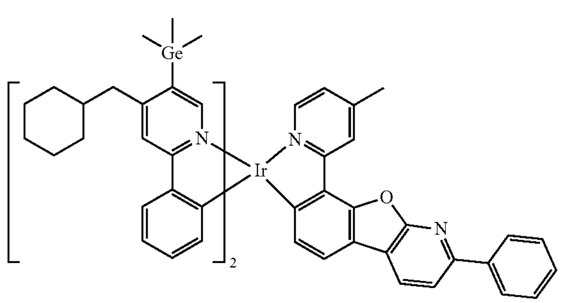
1003
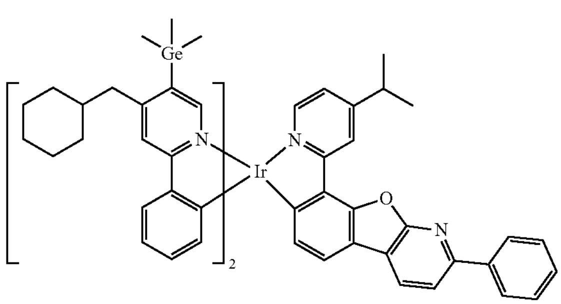
1004
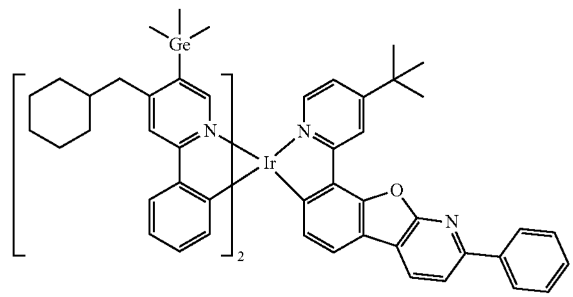
1005
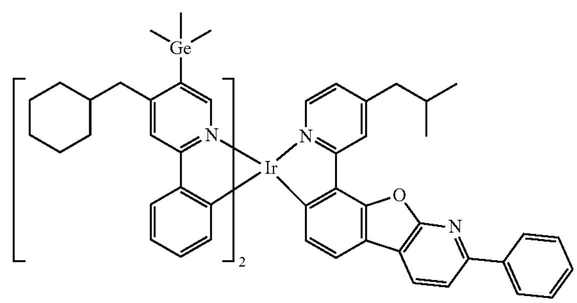
1006
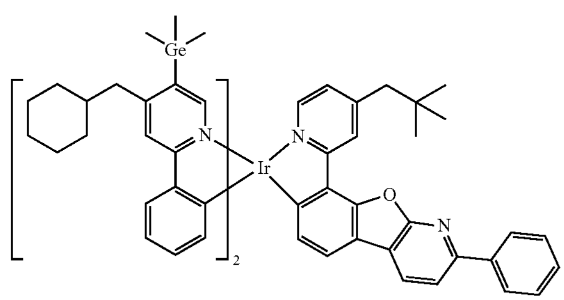
1007
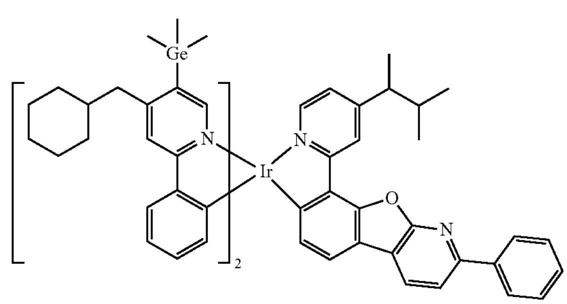
1008
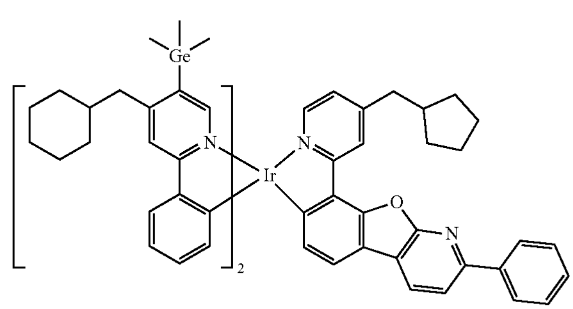

1009
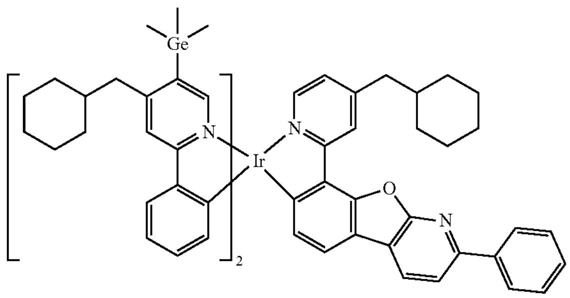
1010
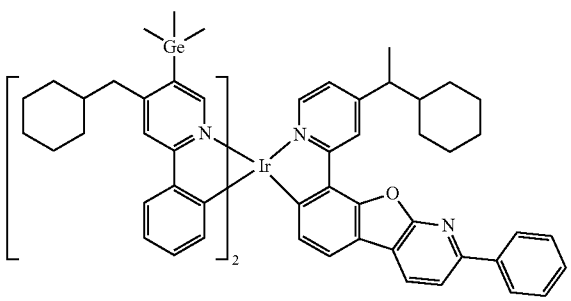
1011
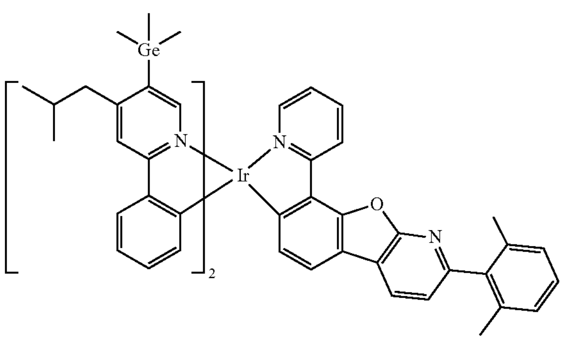
1012
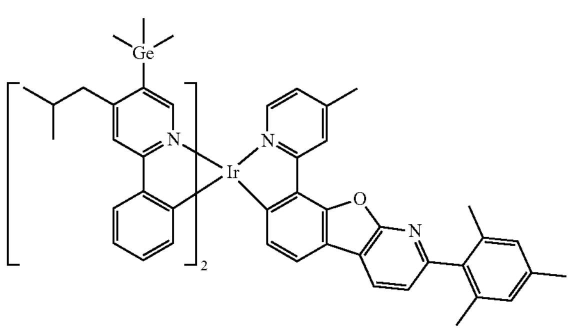
1013
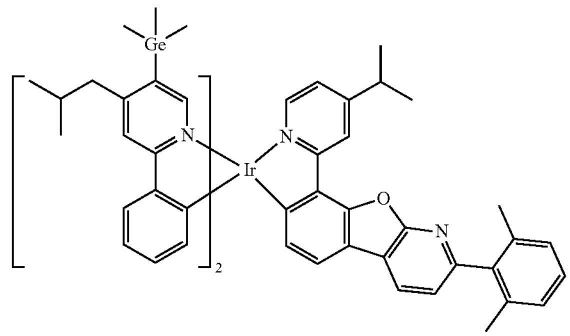
1014
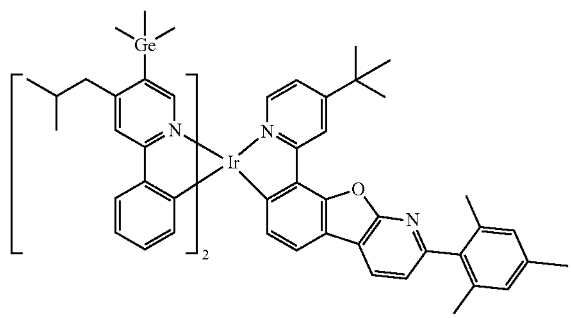
1015
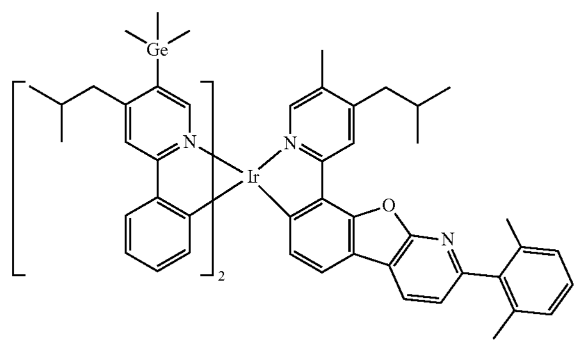
1016
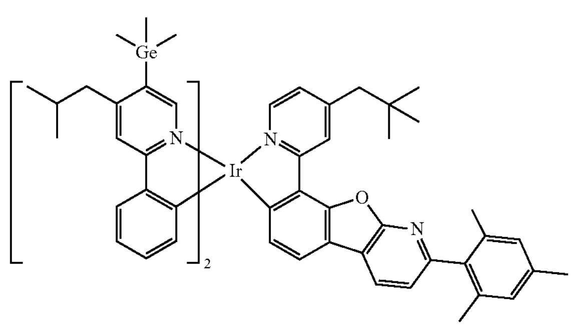

-continued
1017
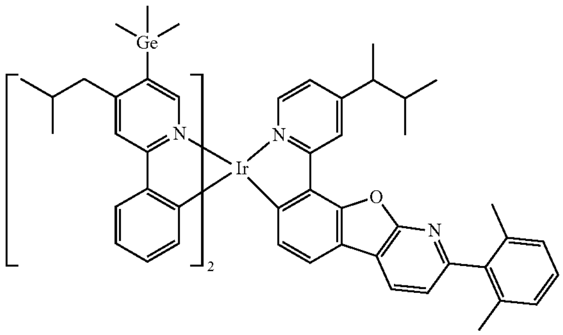
1018
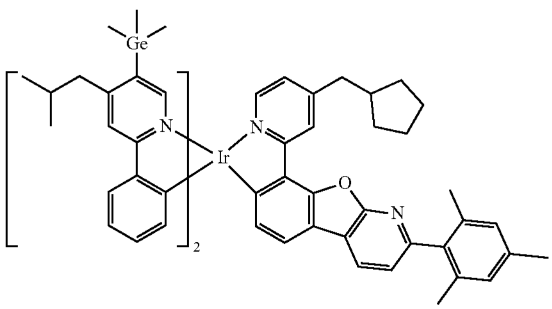
1019
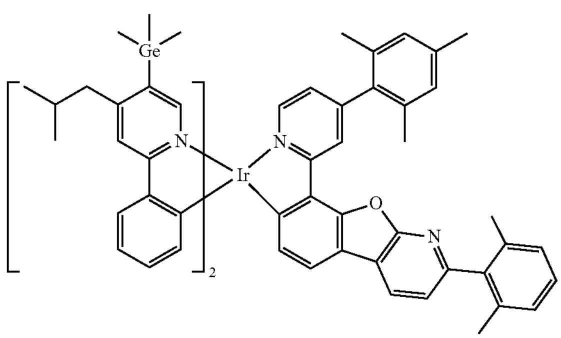
1020
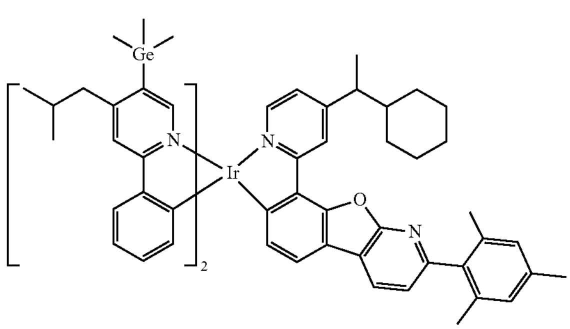
-continued
1021
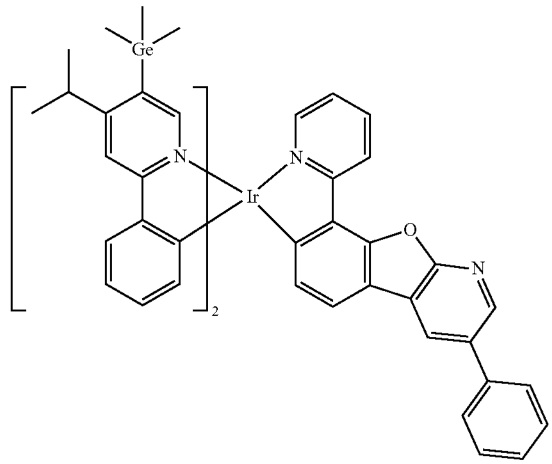
1022
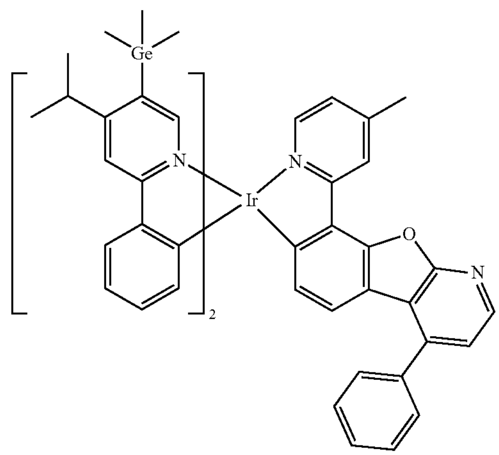
1023
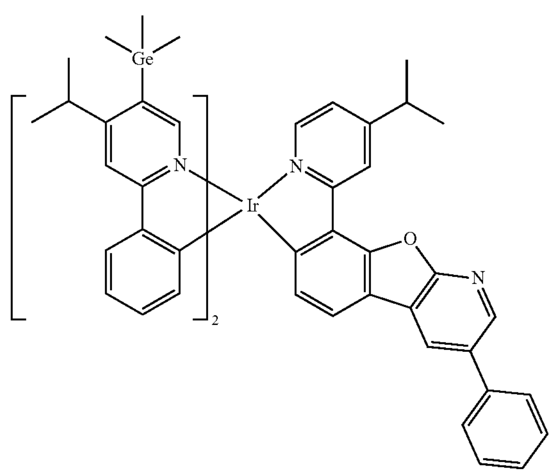

-continued
1024
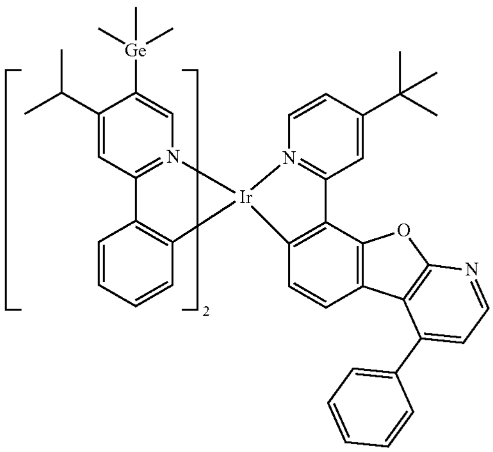
1025
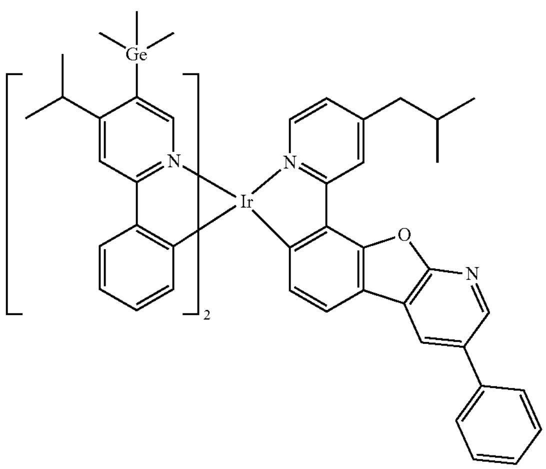
1026
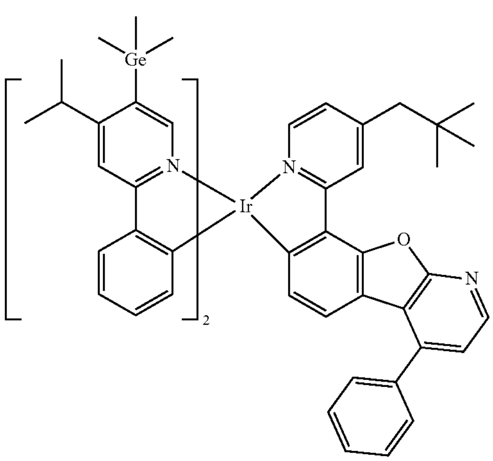
-continued
1027
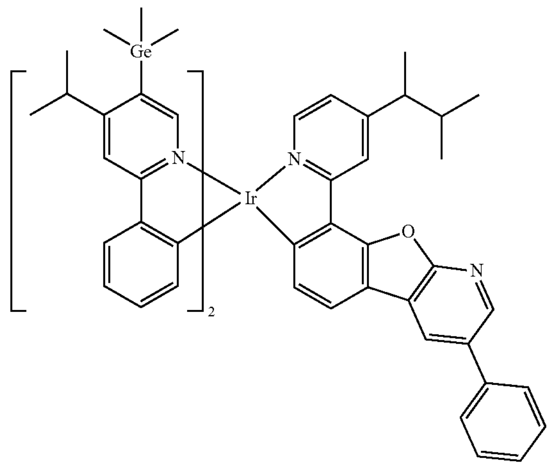
1028
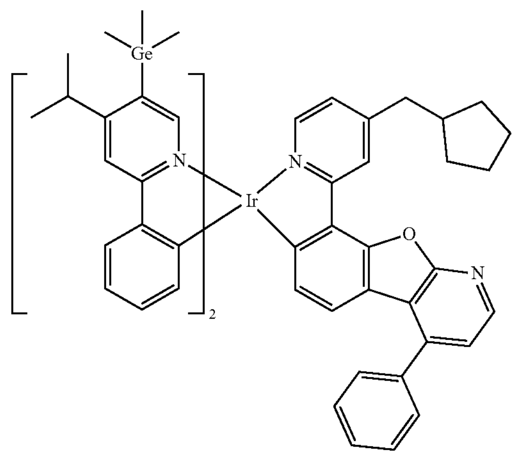
1029
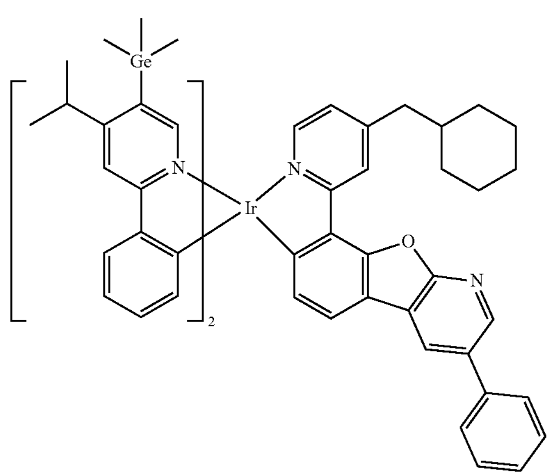

-continued
1030
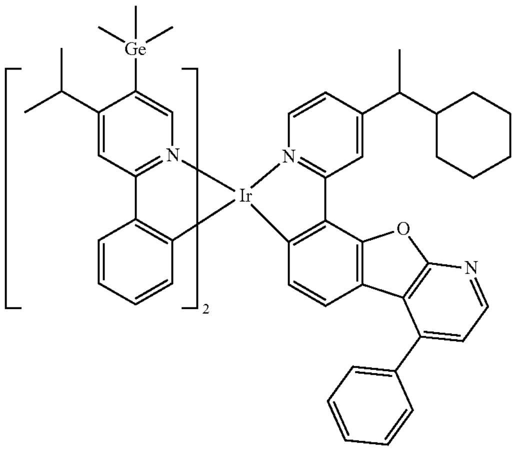
1031
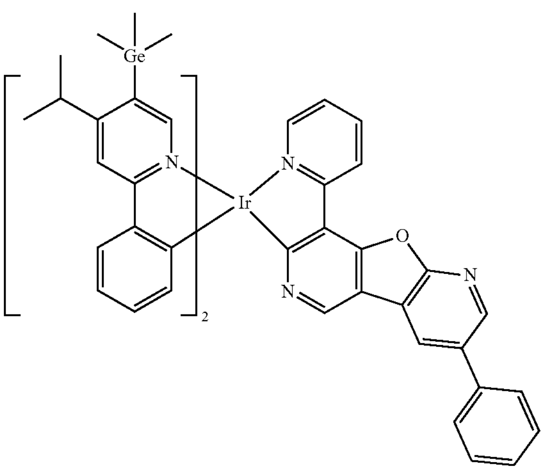
1032
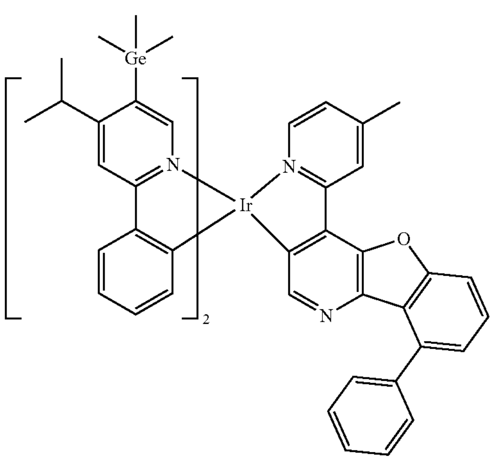
-continued
1033
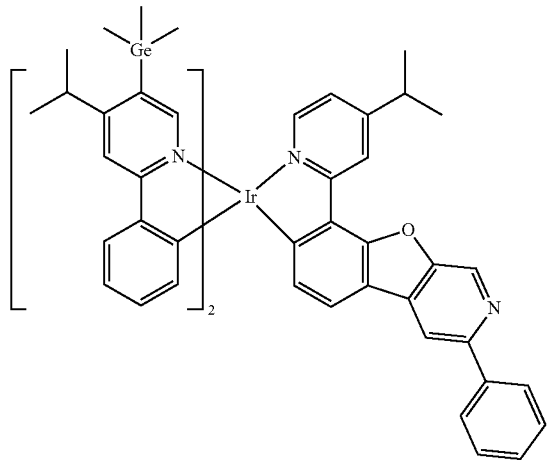
1034
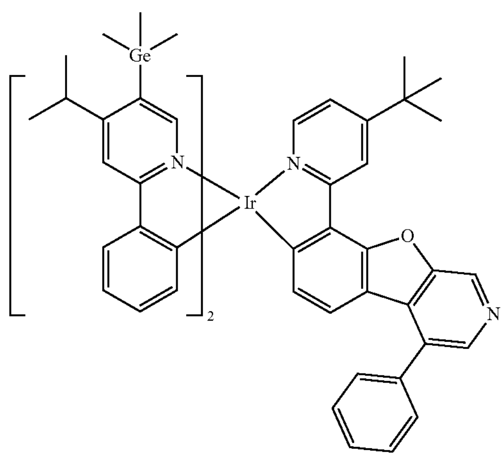
1035
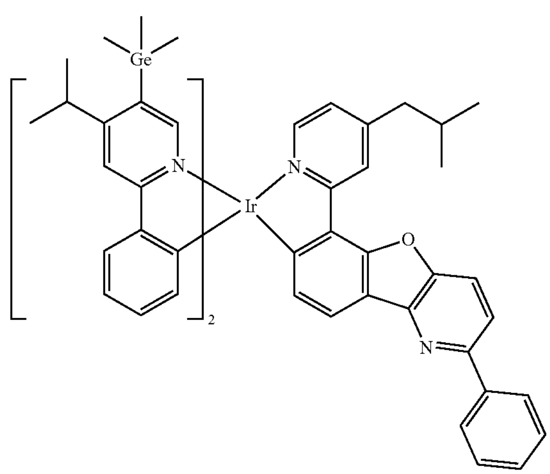

-continued
1036
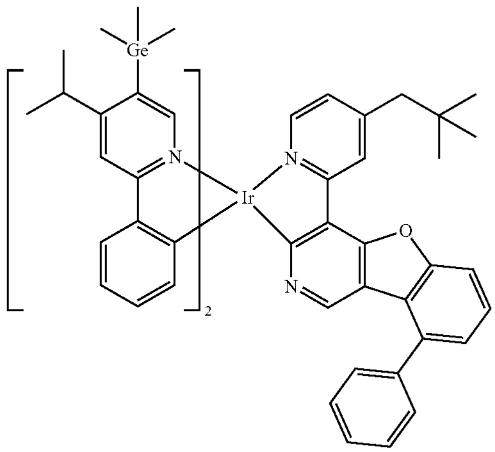
1037
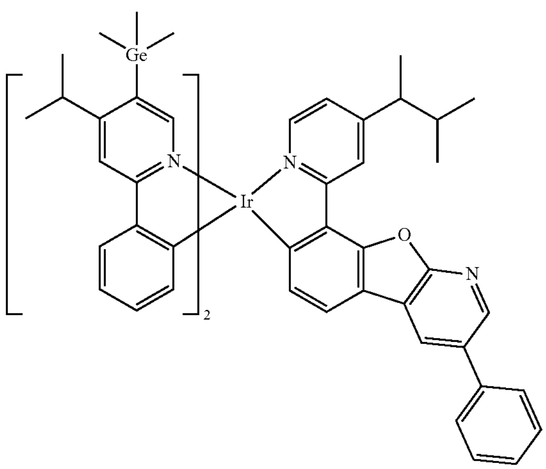
1038
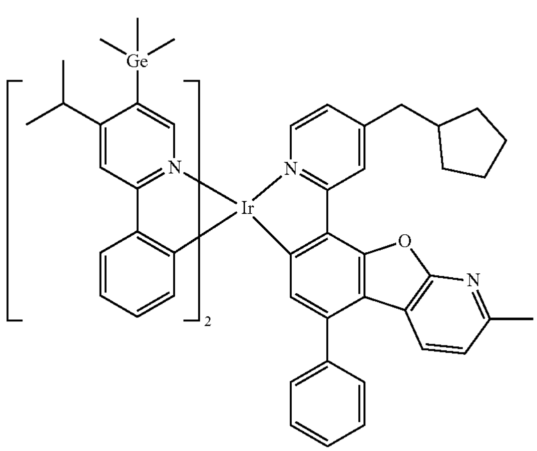
-continued
1039
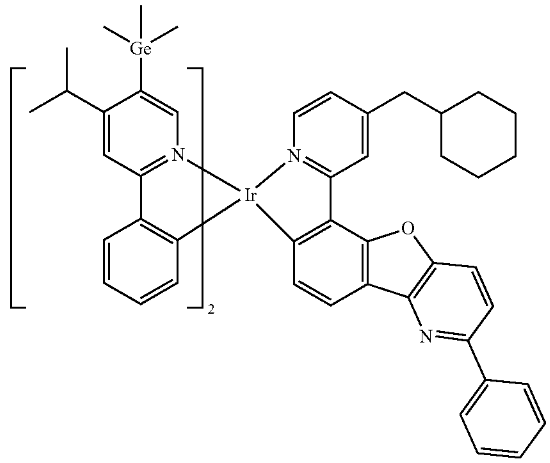
1040
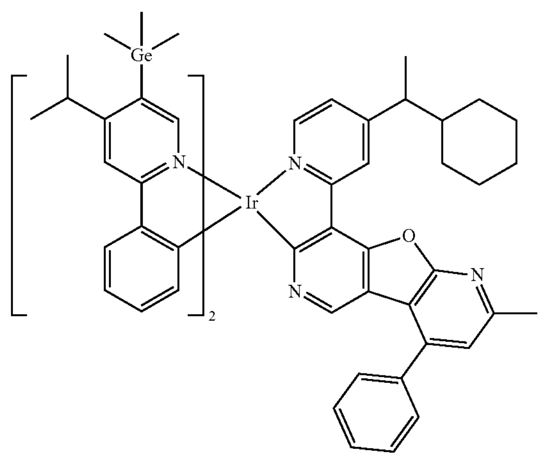
1041
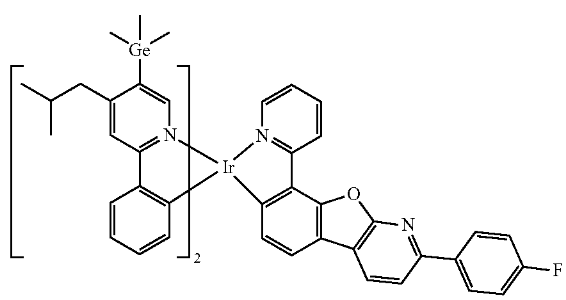
1042
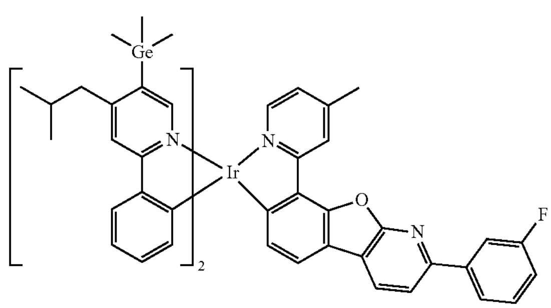

1043
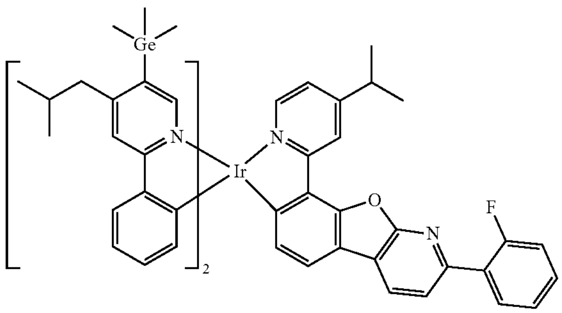
1044
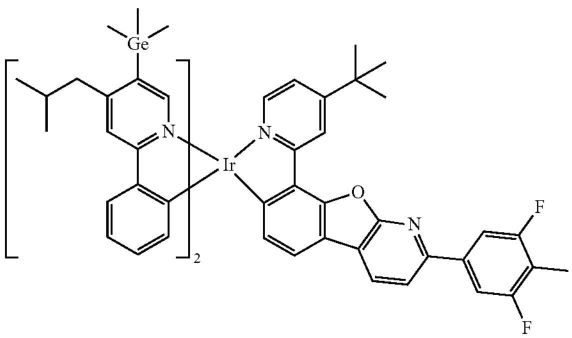
1045
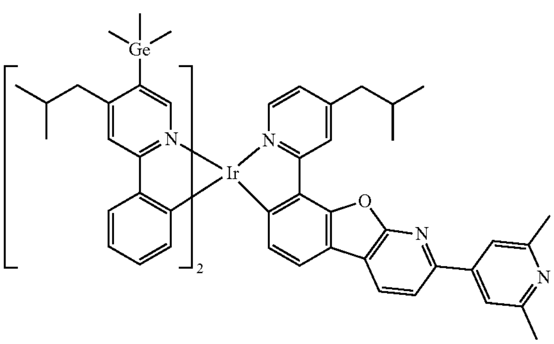
1046
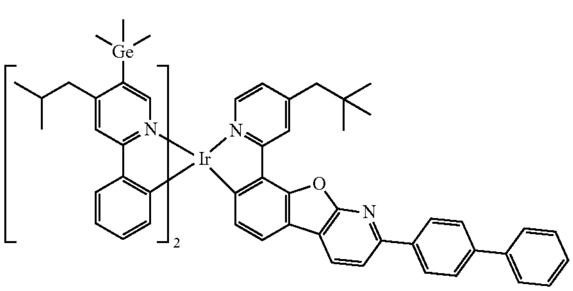
1047
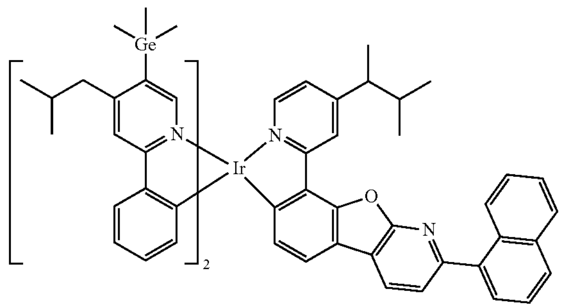
1048
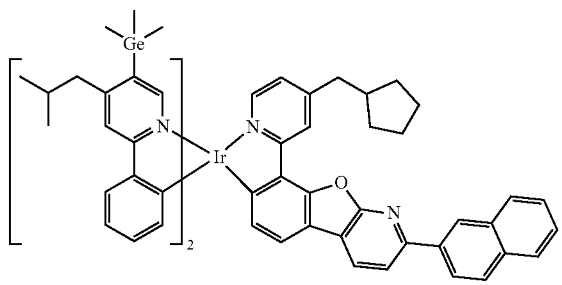
1049
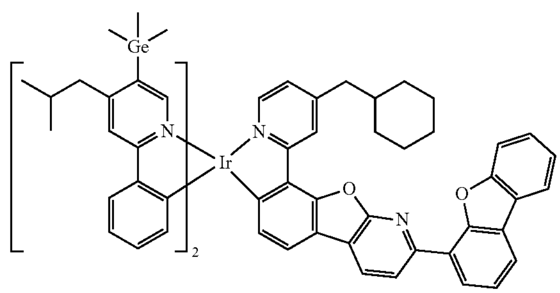
1050
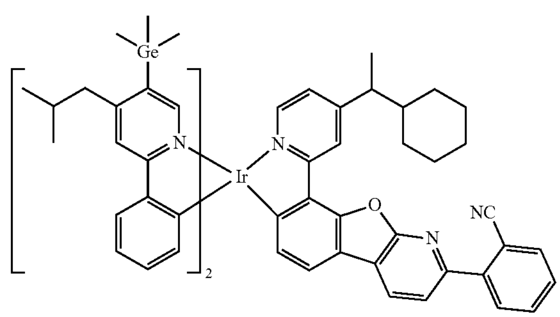
1051
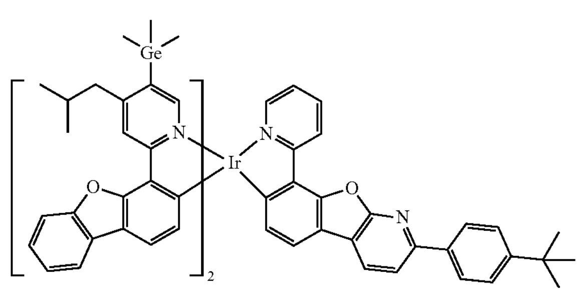

1052
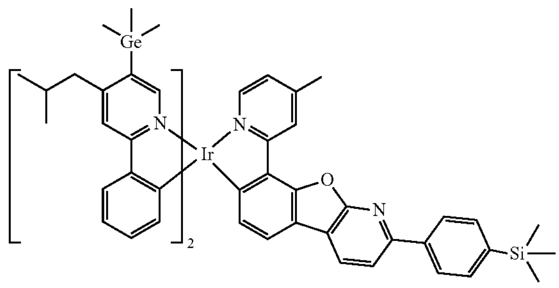
1053
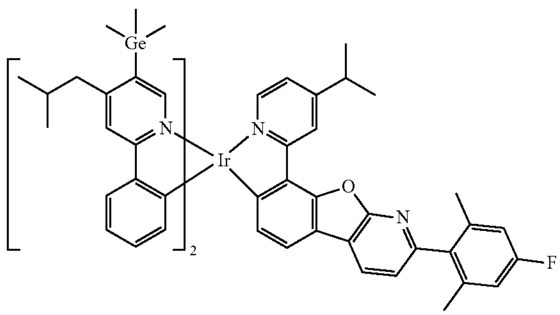
1054
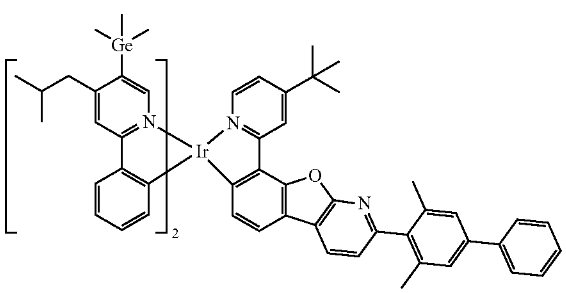
1055
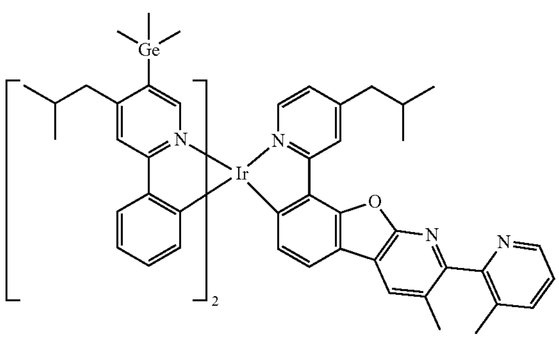
1056
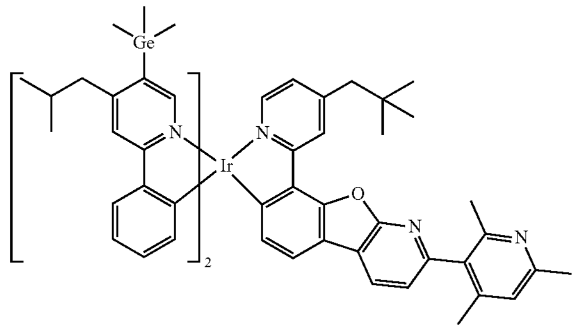
1057
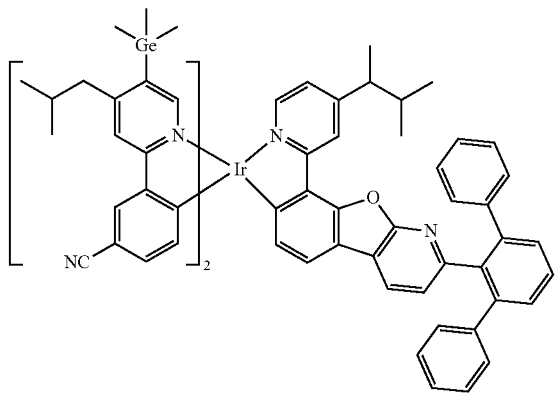
1058
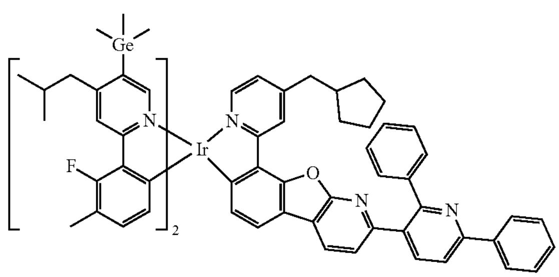
1059
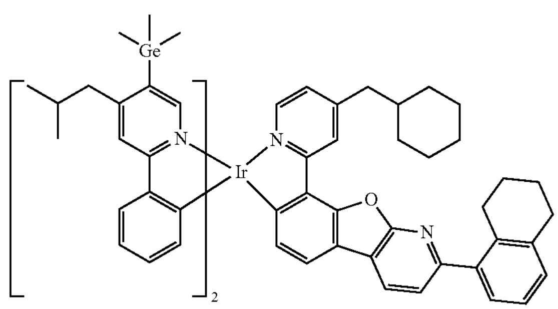

-continued
1060
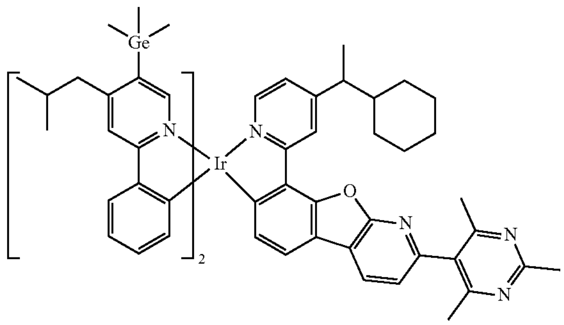
1061
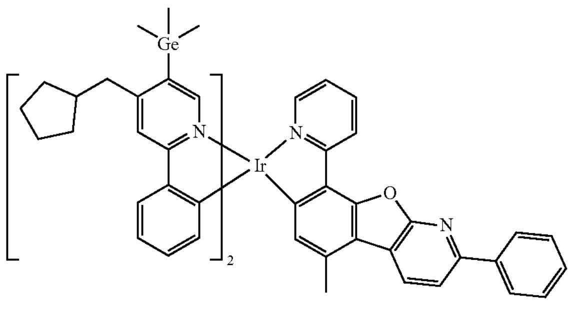
1062
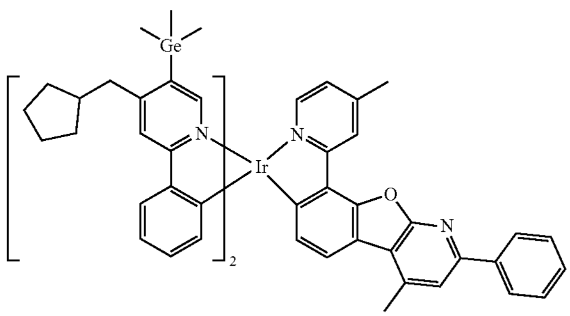
1063
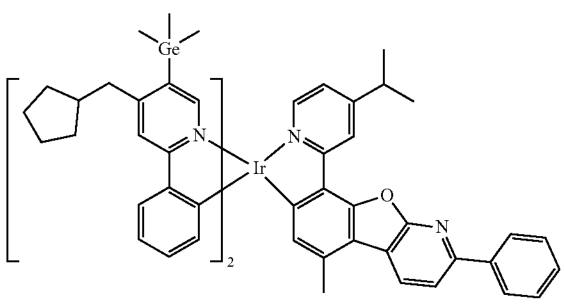
1064
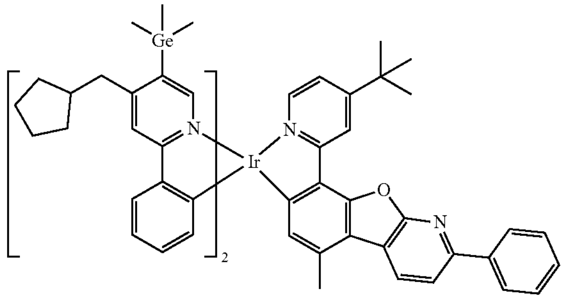
-continued
1065
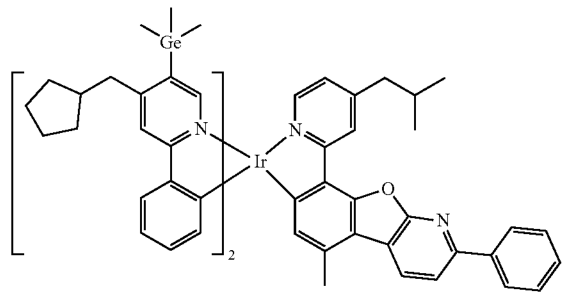
1066
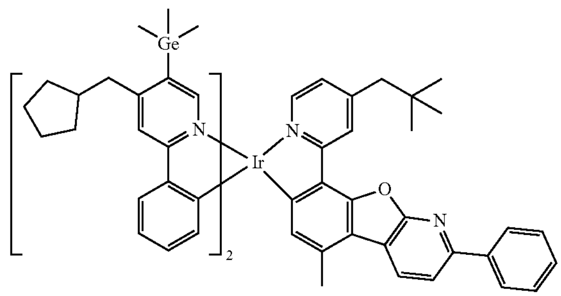
1067
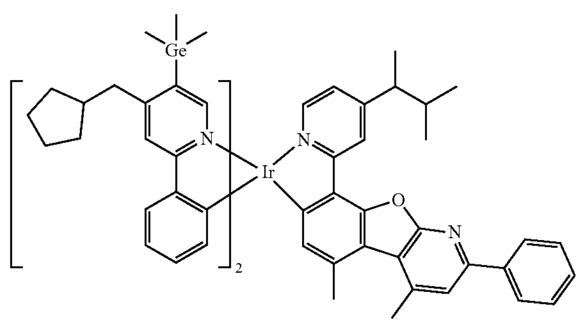
1068
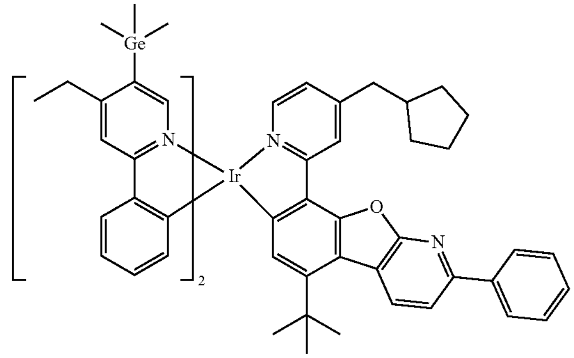

1069
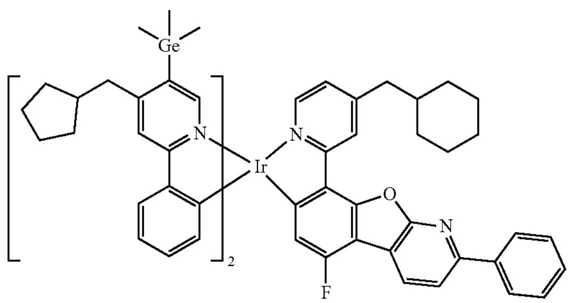
1070
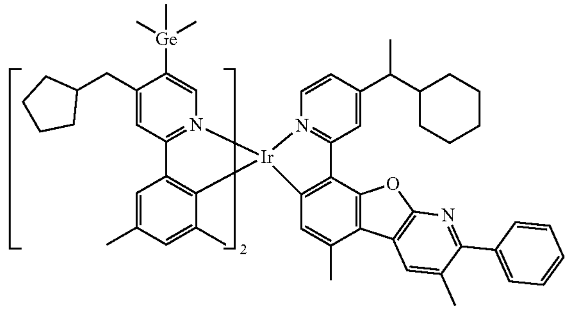
1071
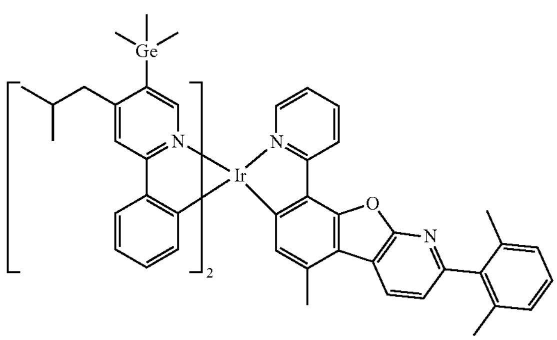
1072
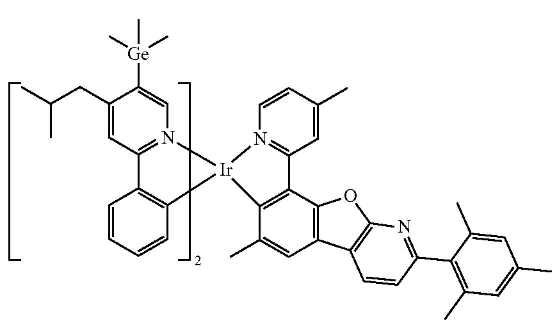
1073
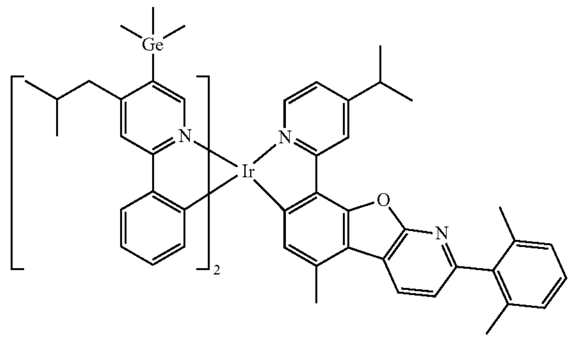
1074
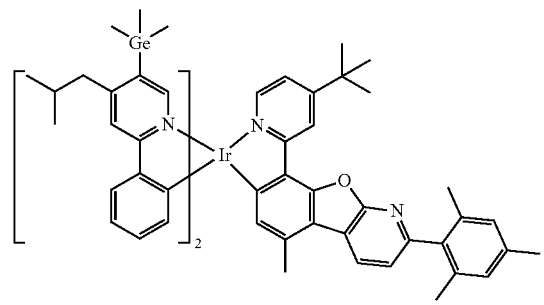
1075
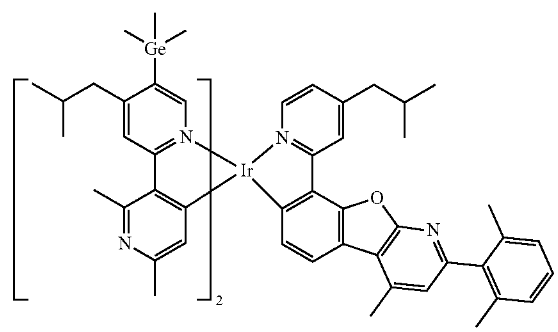
1076
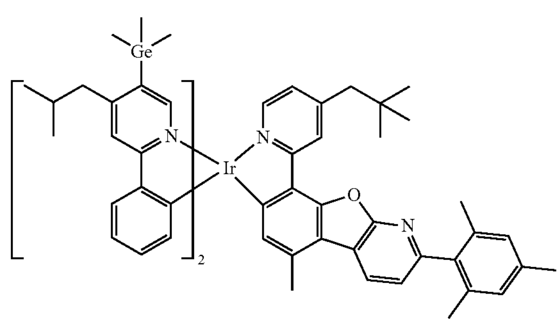

1077
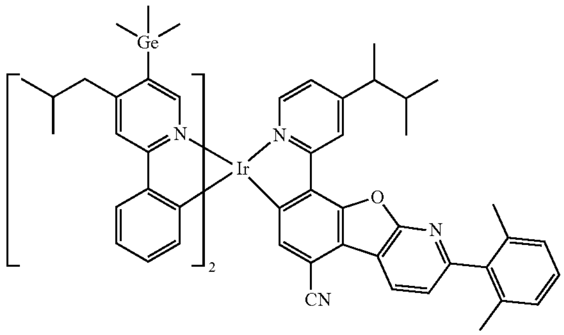
1078
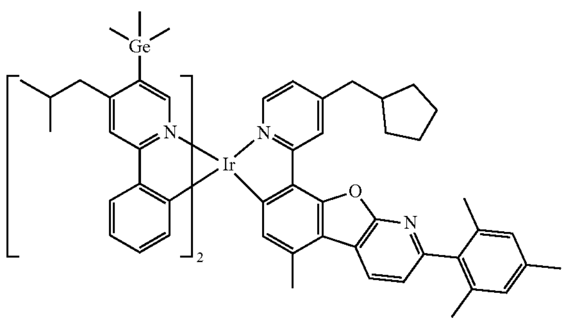
1079
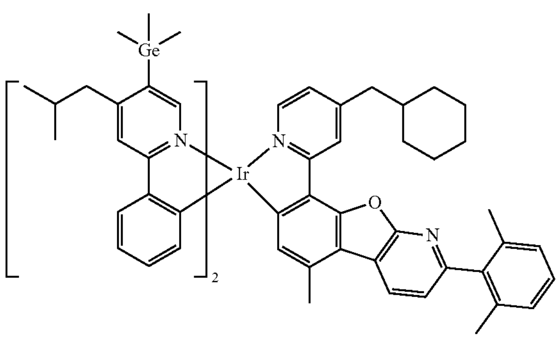
1080
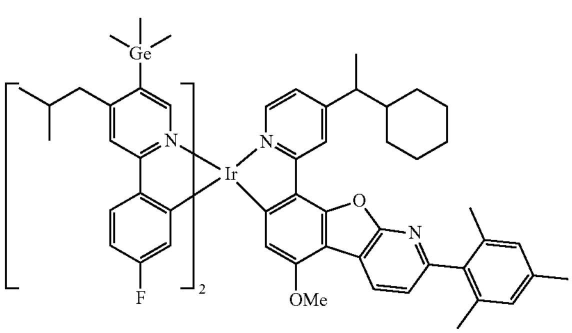
1081
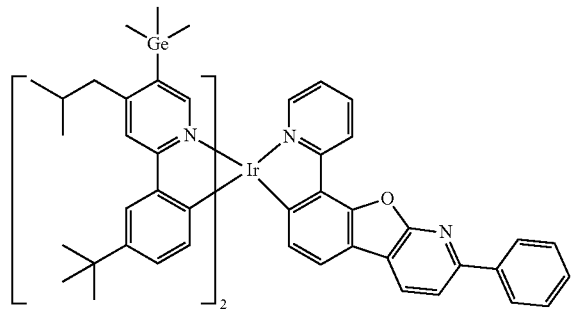
1082
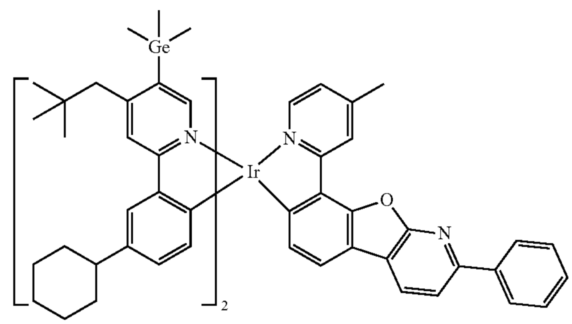
1083
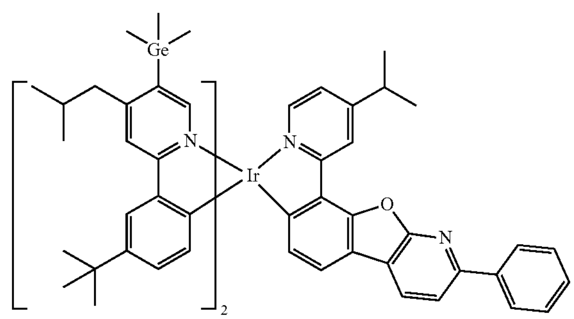
1084
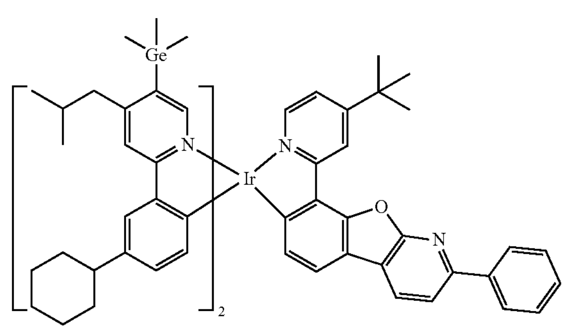

-continued
1085
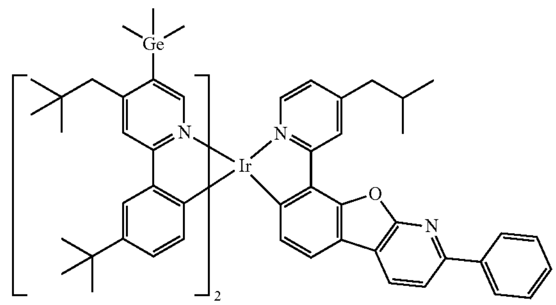
1086
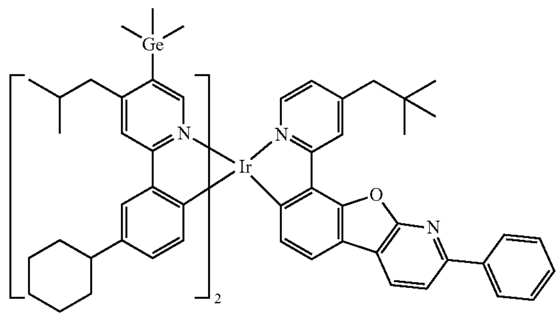
1087
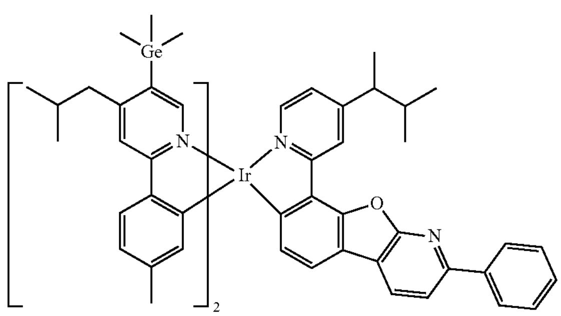
1088
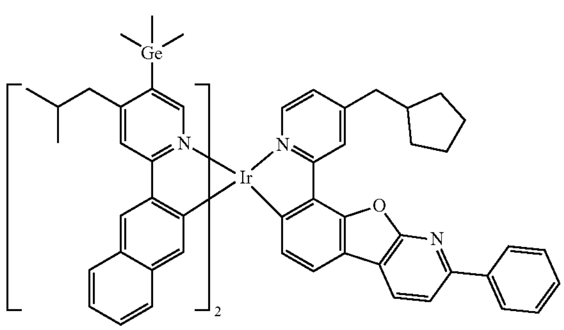
-continued
1089
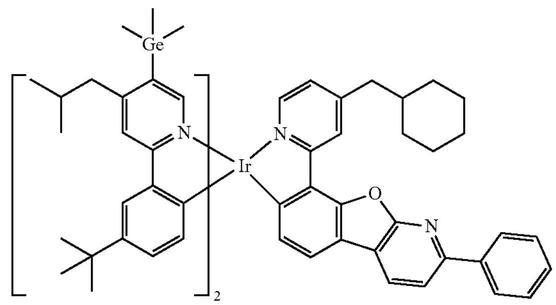
1090
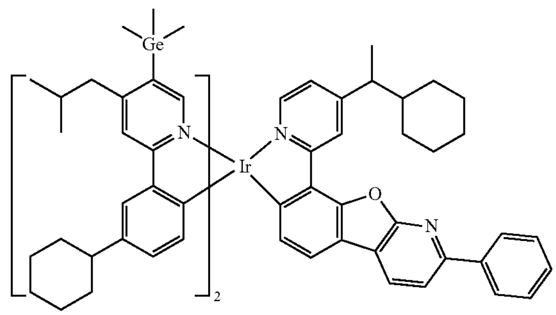
1091
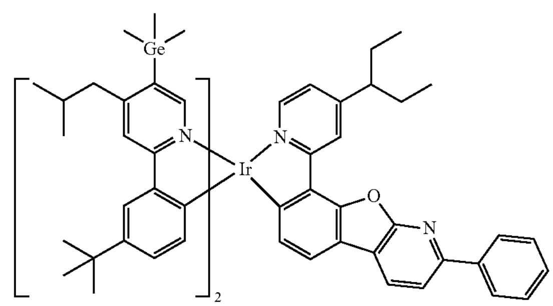
1092
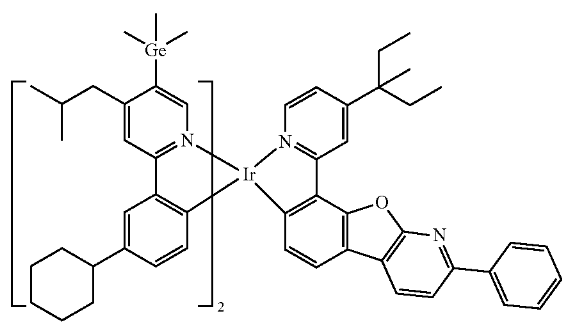
1093
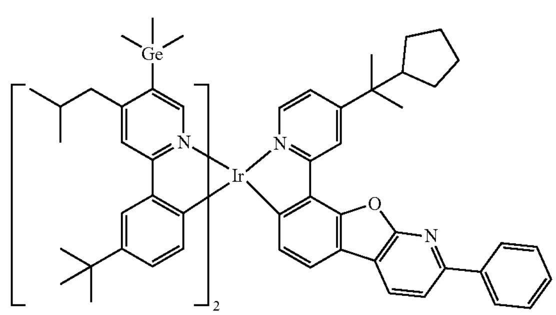

-continued
1094
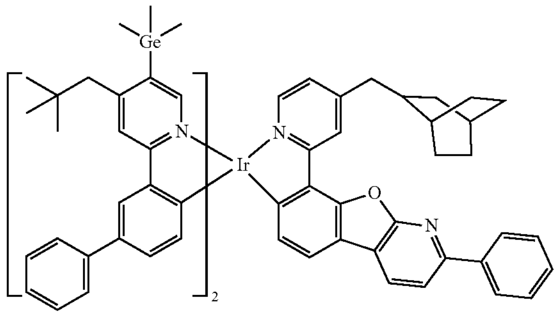
1095
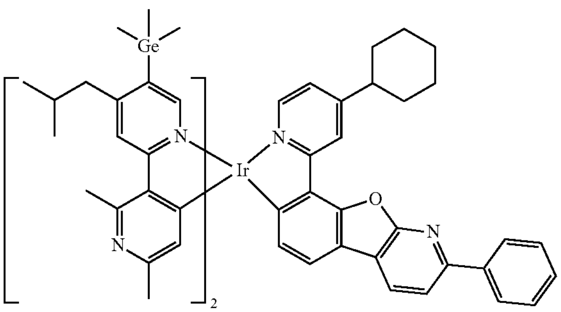
1096
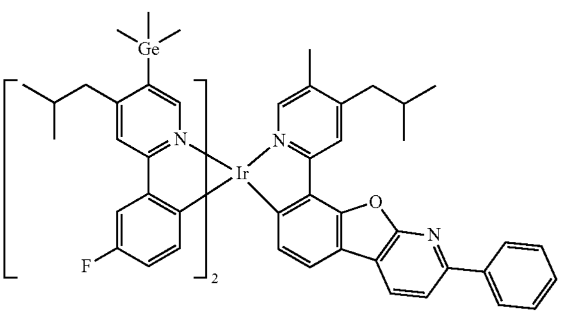
1097
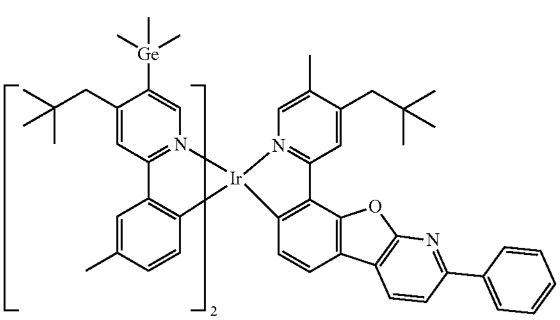
-continued
1098
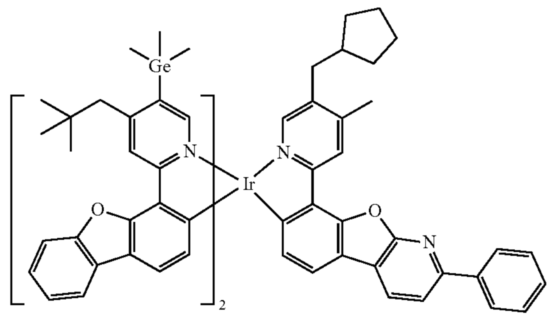
1099
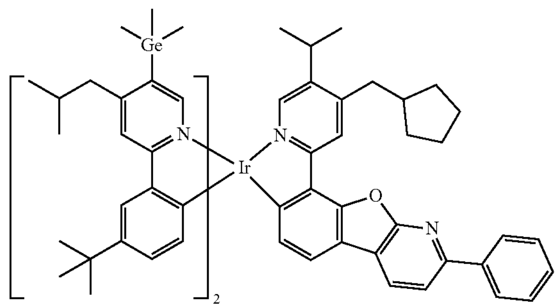
1100
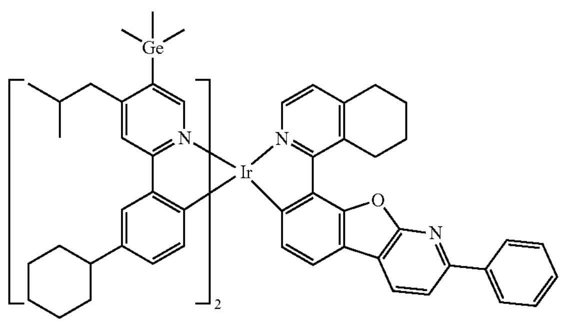
1101
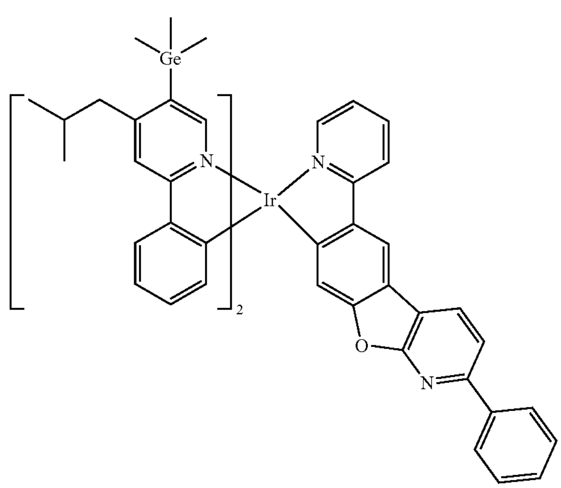

1102
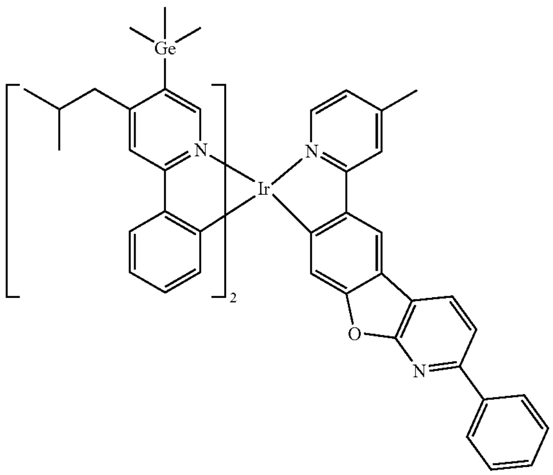
1103
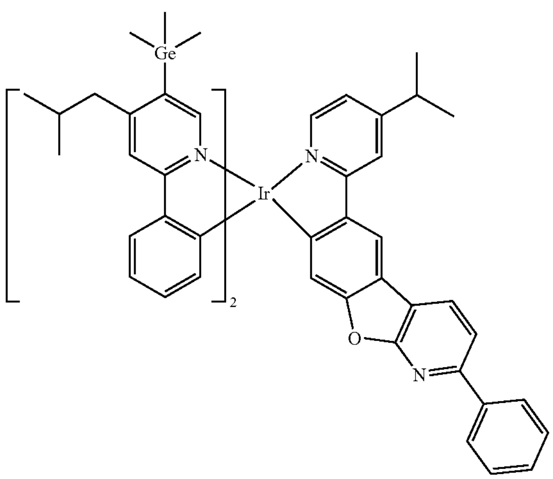
1104
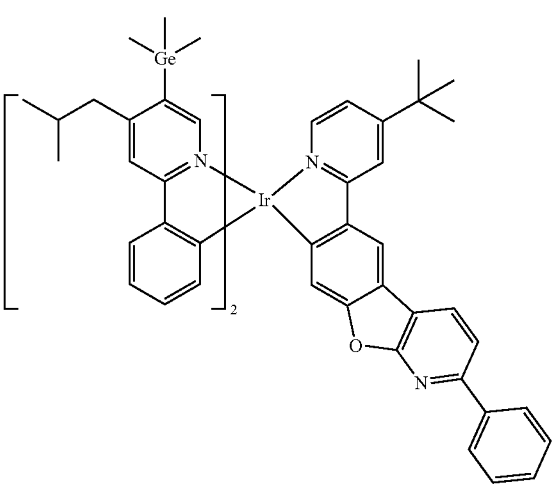
1105
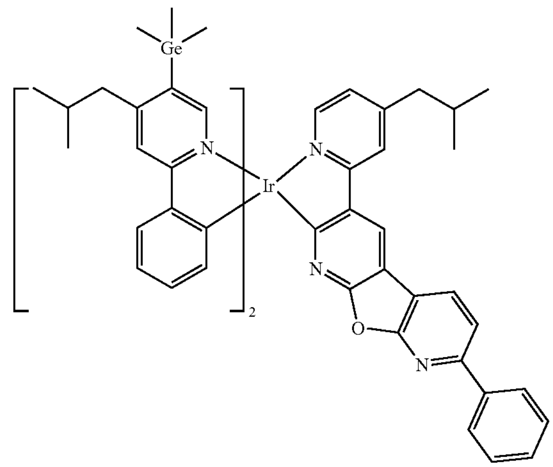
1106
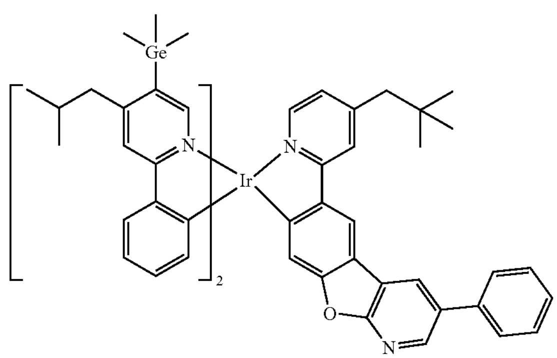
1107
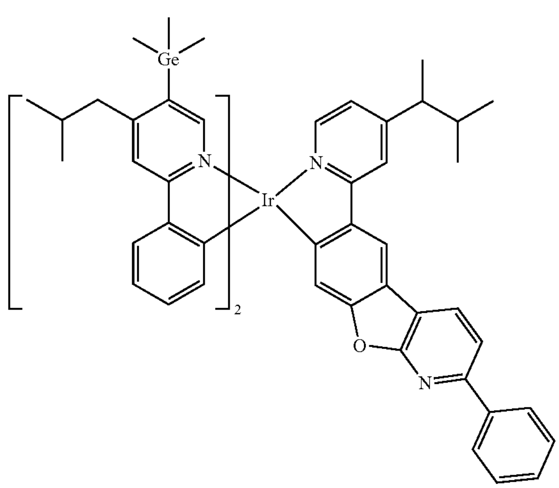

-continued
1108
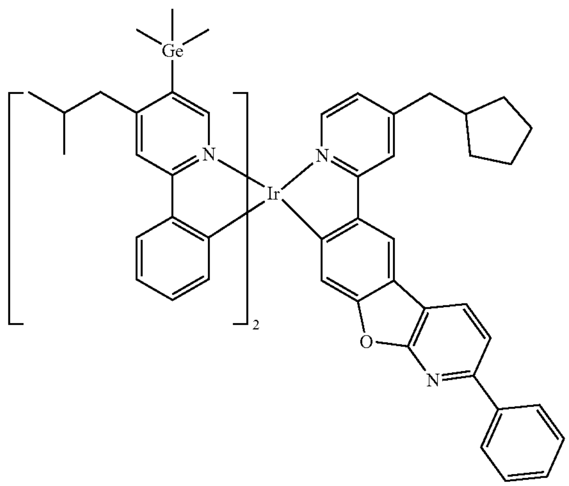
1109
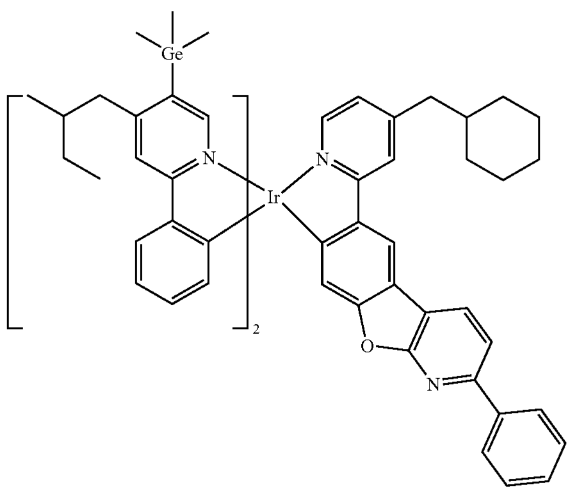
1110
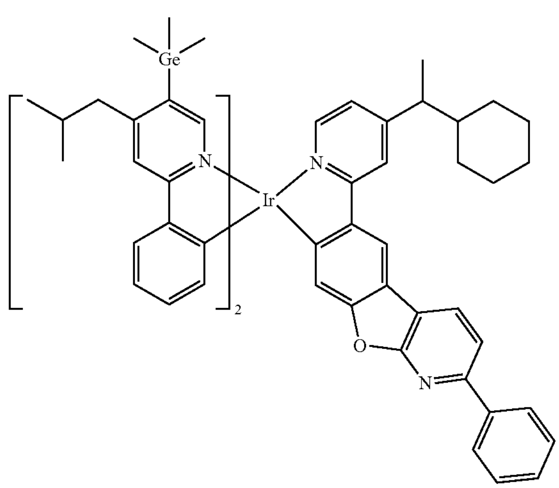
-continued
1111
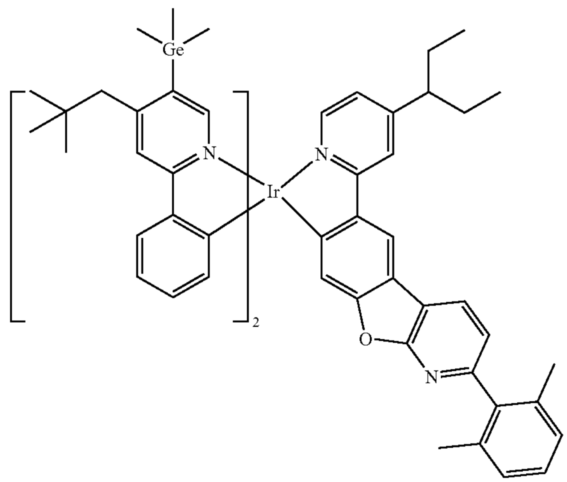
1112
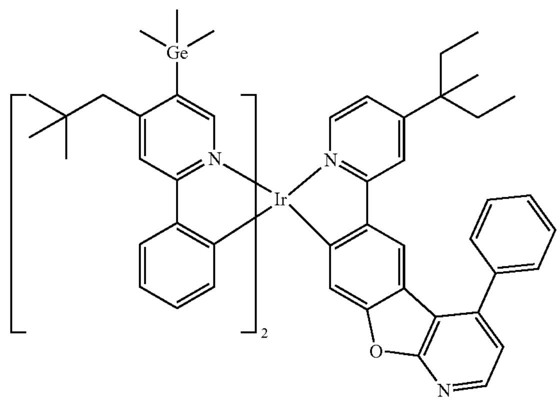
1113
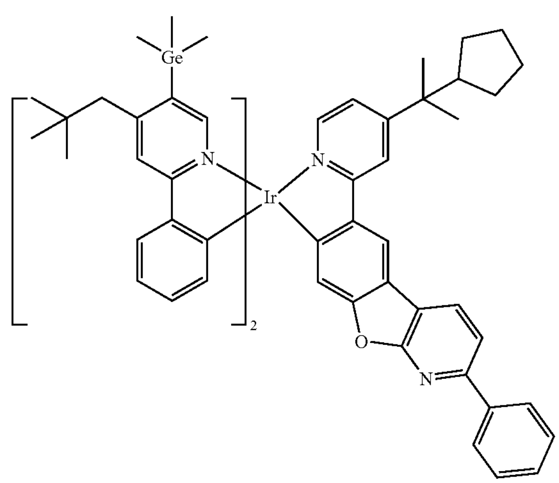

-continued
1114
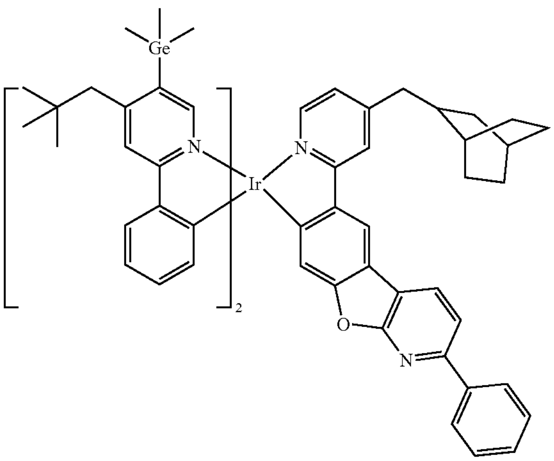
1115
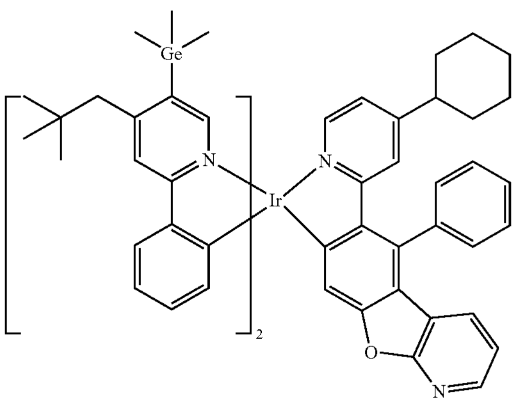
1116
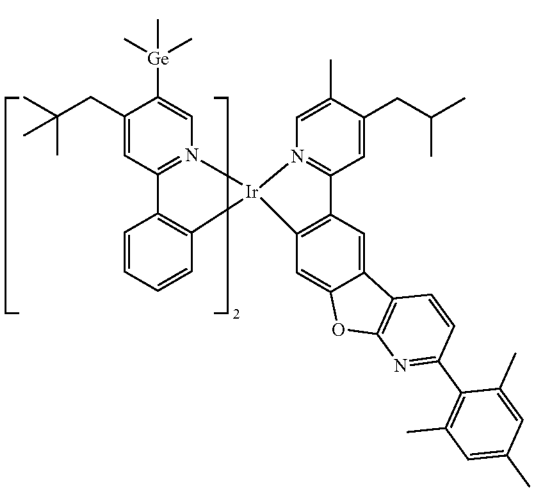
-continued
1117
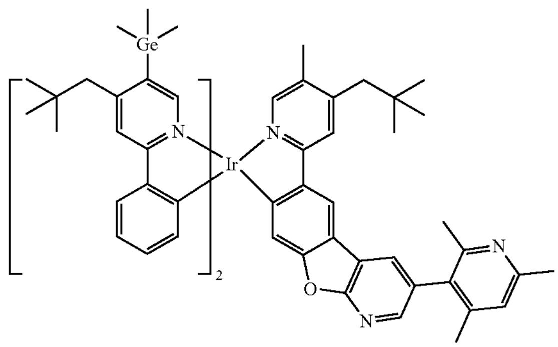
1118
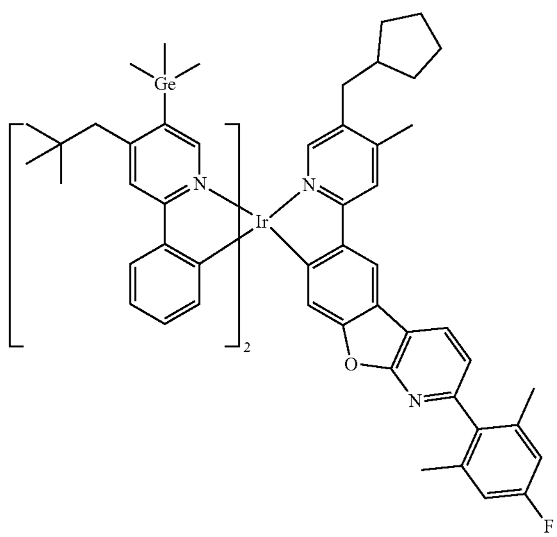
1119
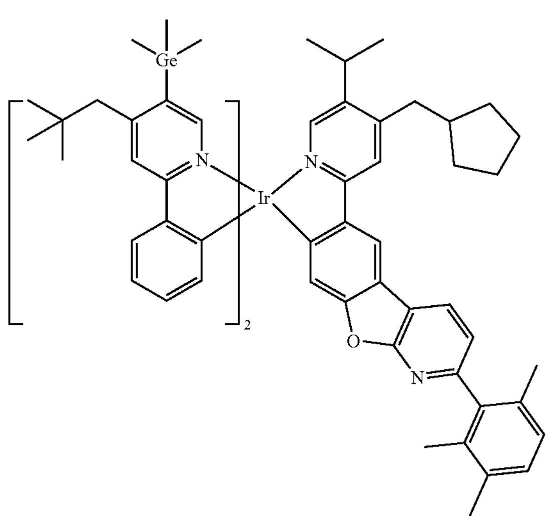

1120
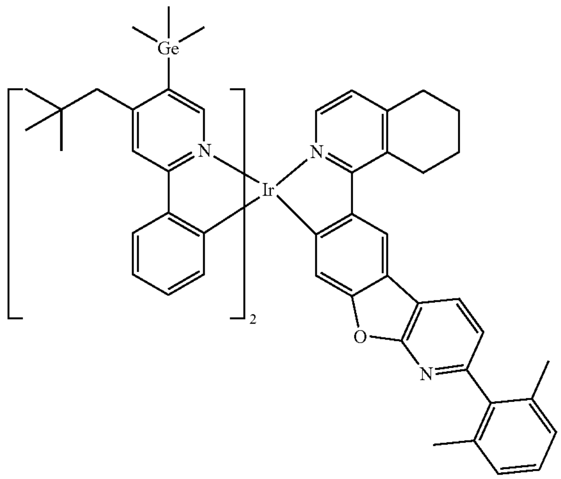
1121
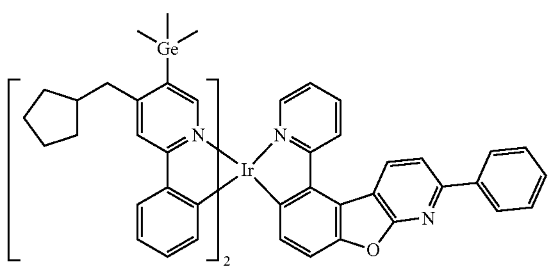
1122
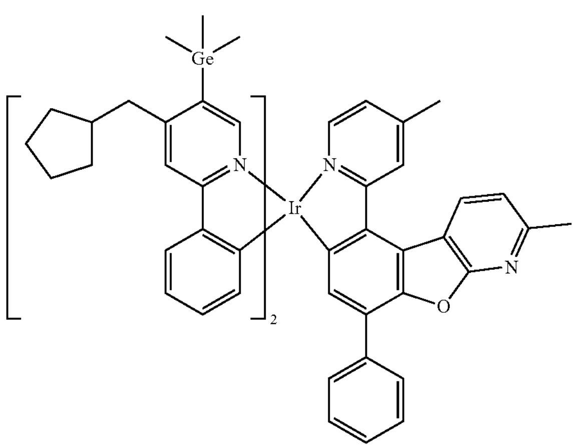
1123
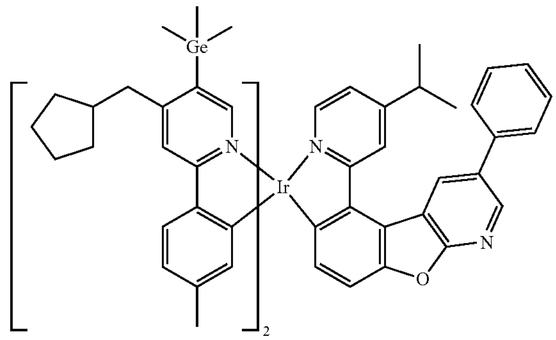
1124
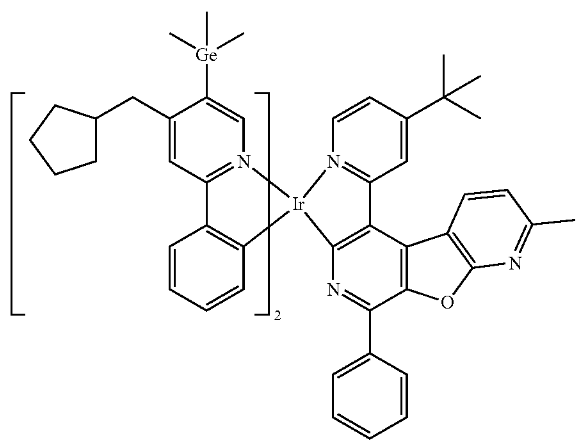
1125
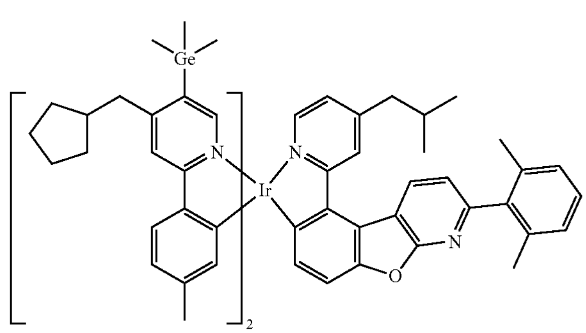

-continued
1126
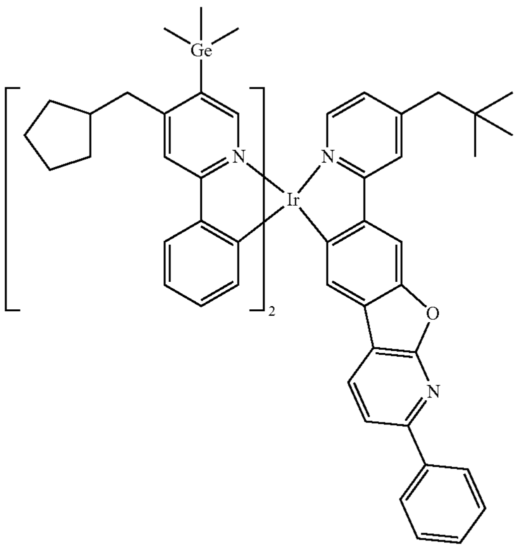
1127
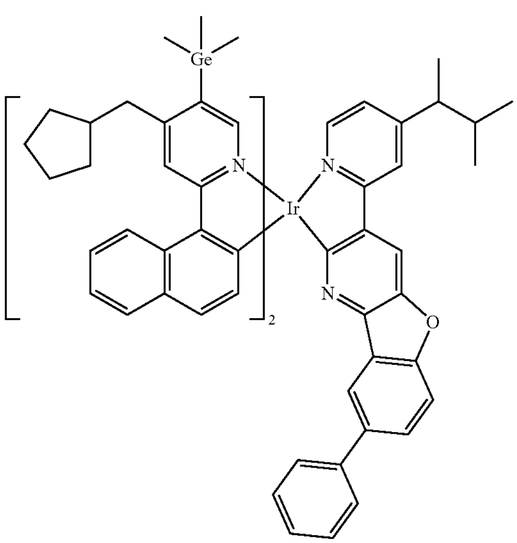
-continued
1128
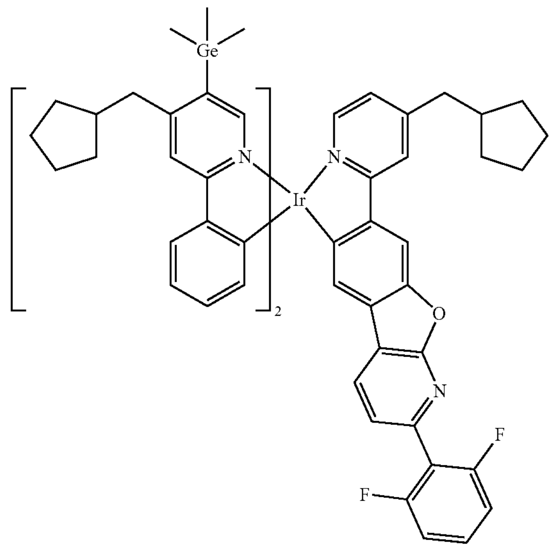
1129
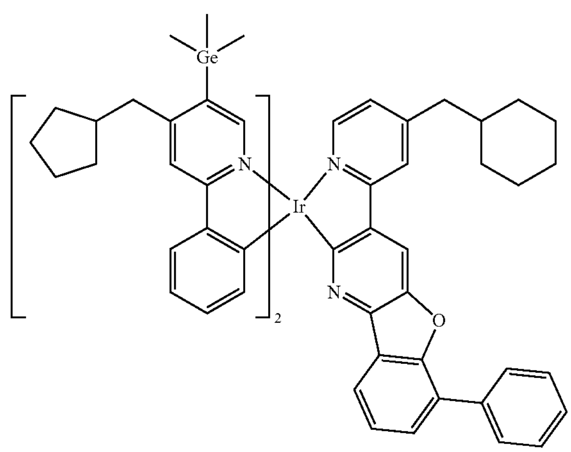
1130
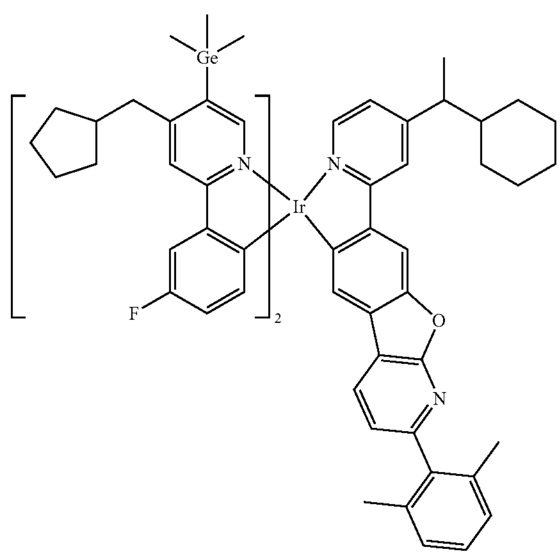

1131
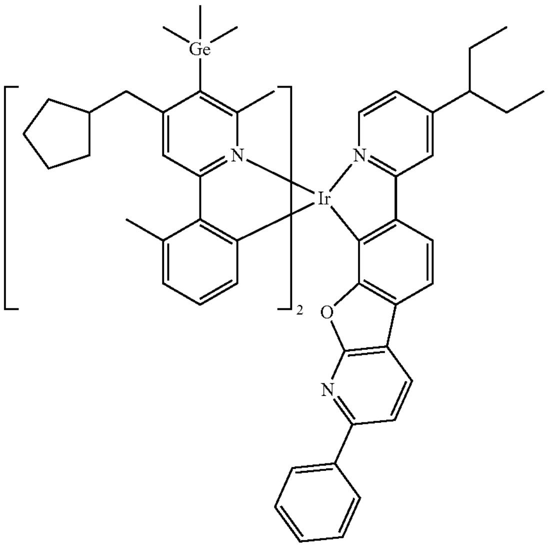
1132
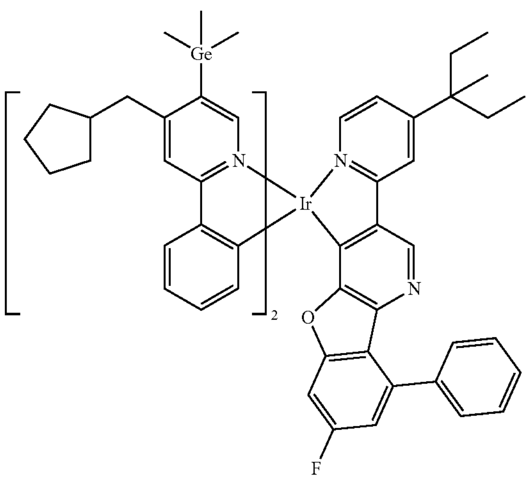
1133
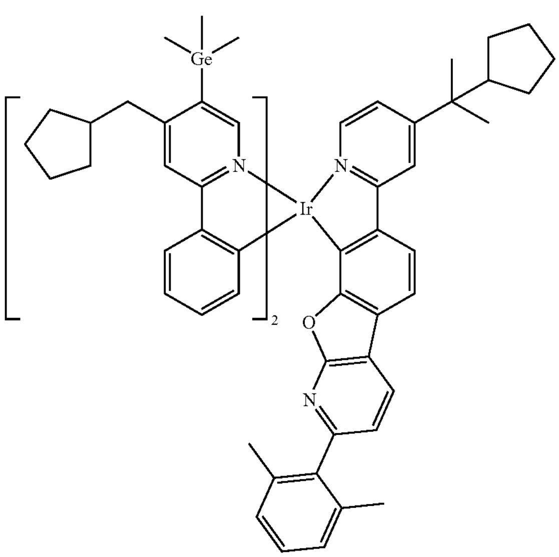
1134
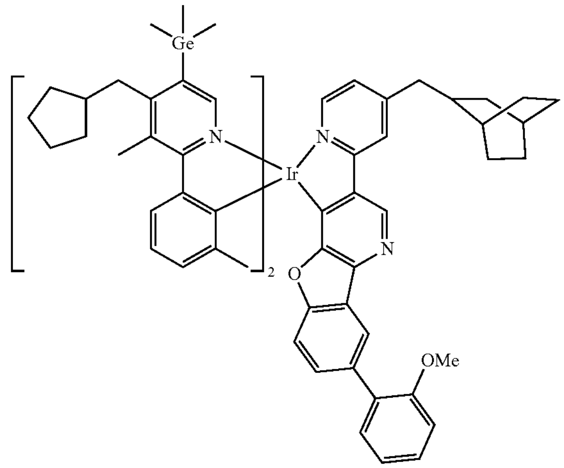
1135
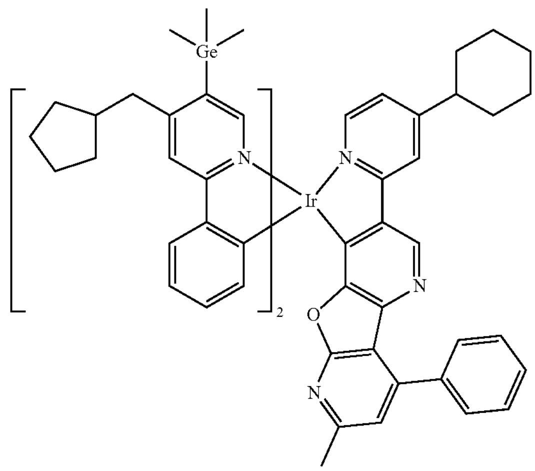
1136
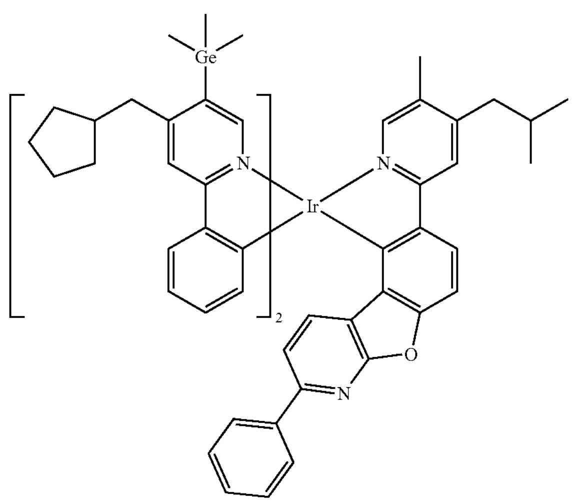

-continued
1137
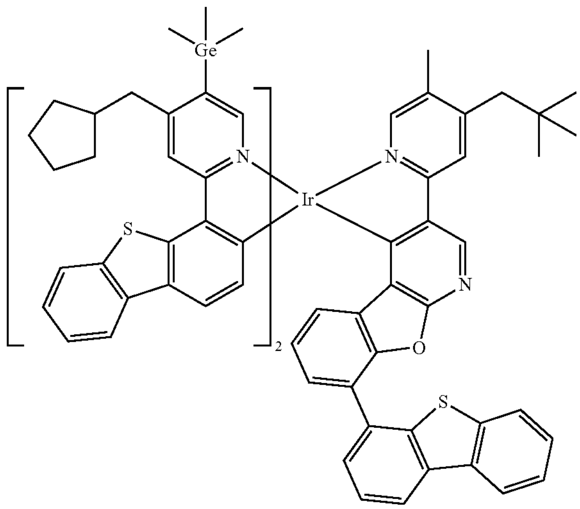
1138
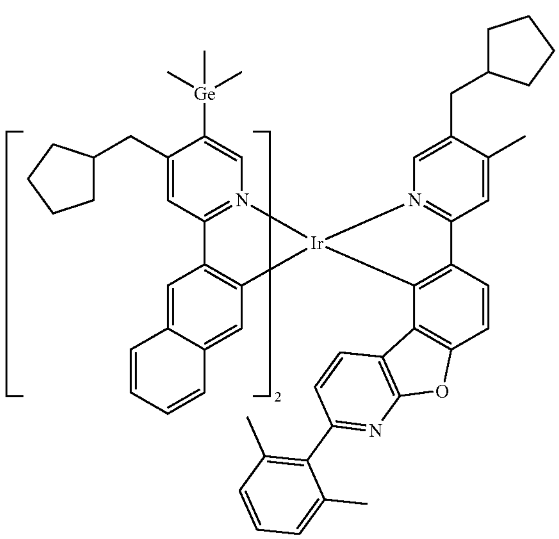
1139
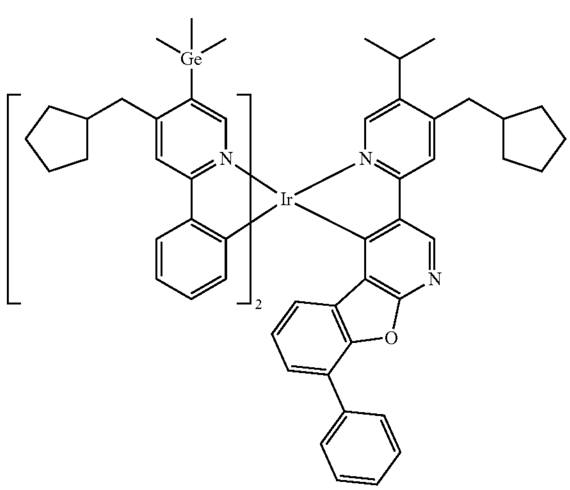
-continued
1140
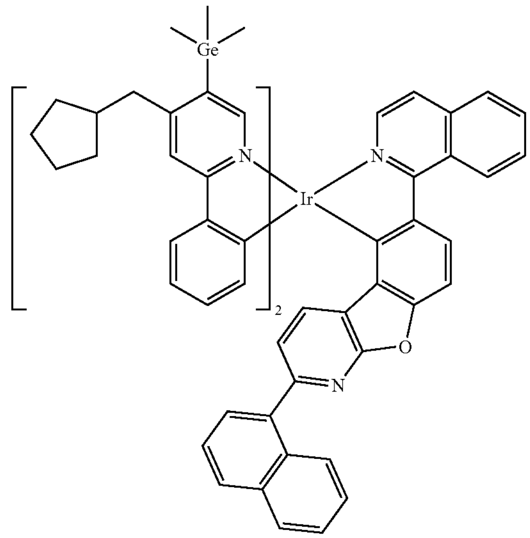
1141
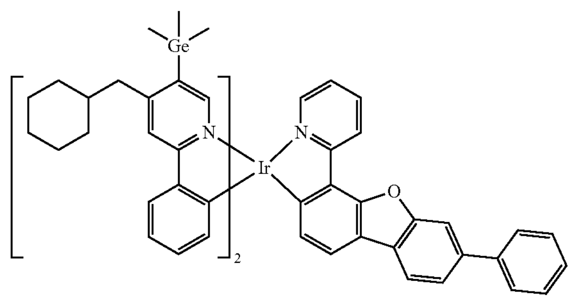
1142
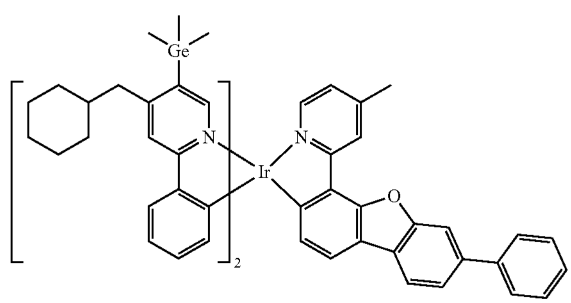
1143
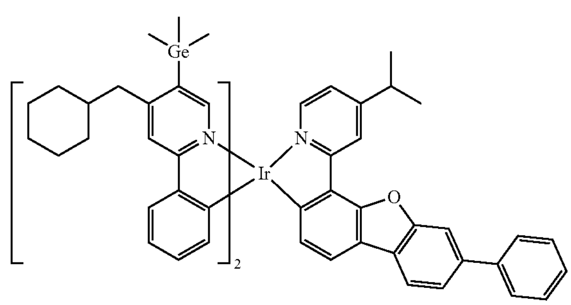

-continued
1144
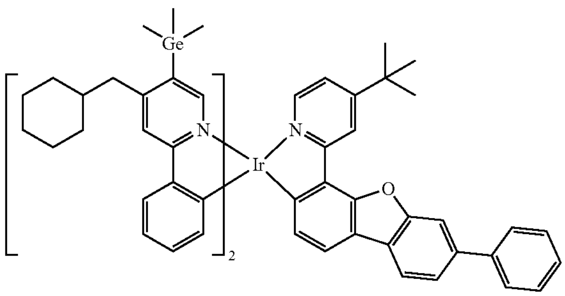
1145
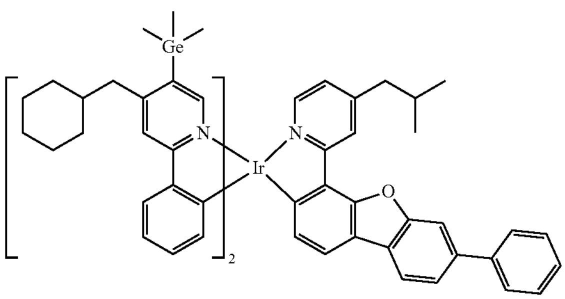
1146
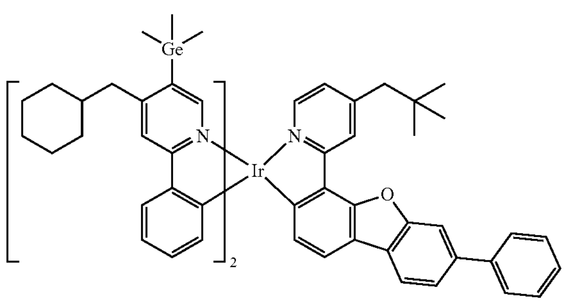
1147
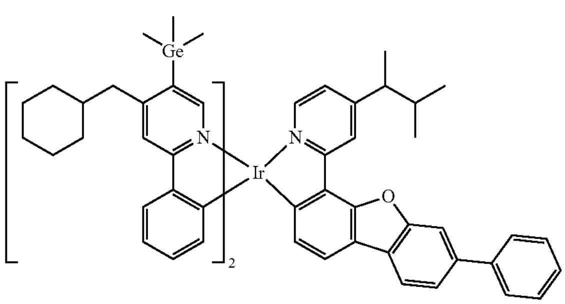
1148
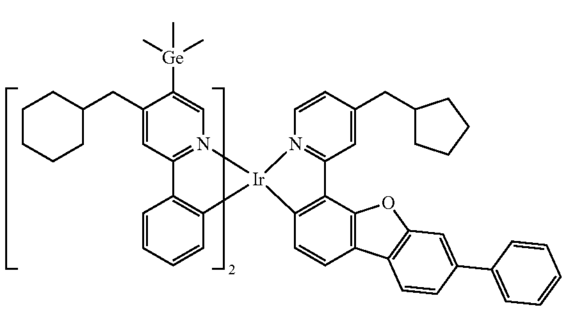
-continued
1149
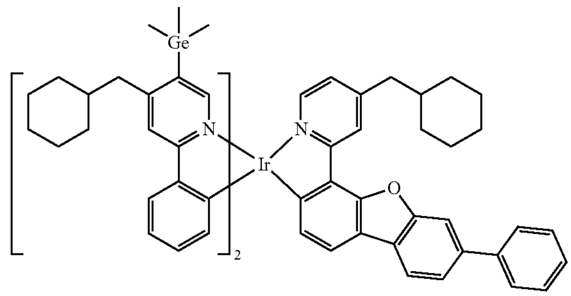
1150
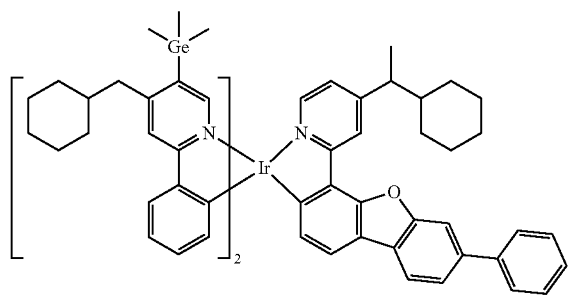
1151
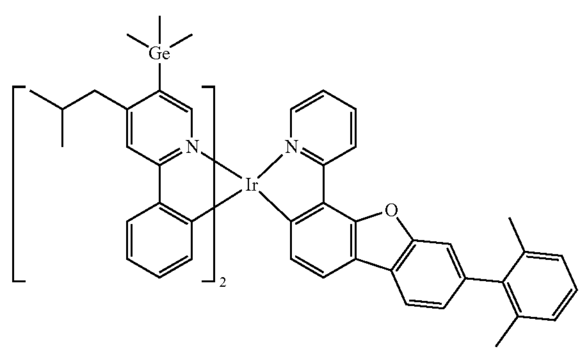
1152
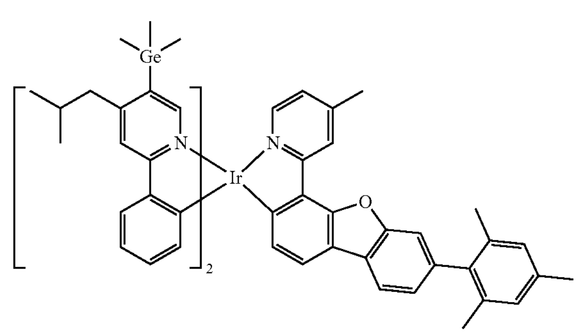

-continued
1153
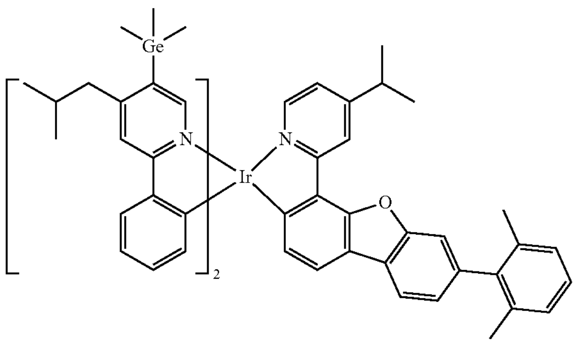
1154
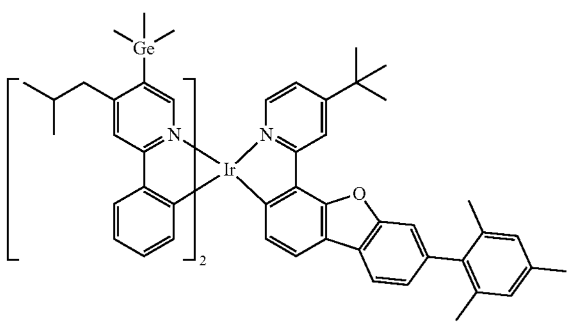
1155
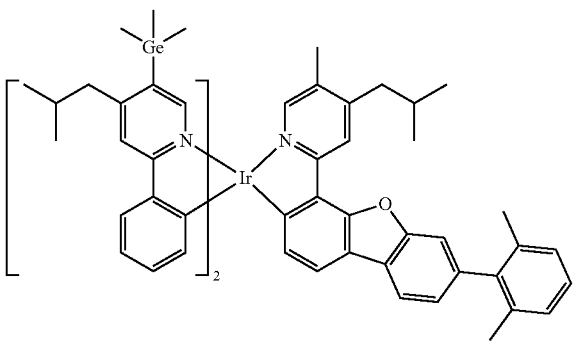
1156
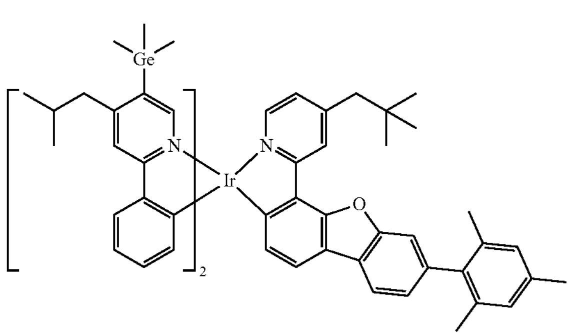
-continued
1157
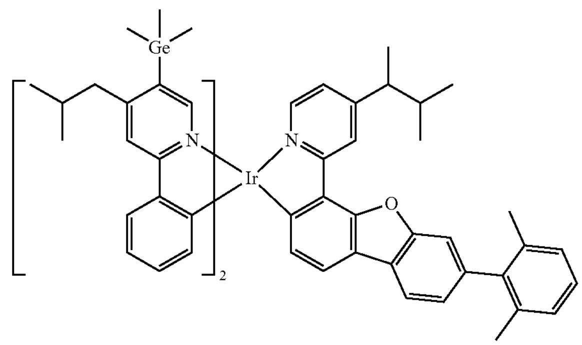
1158
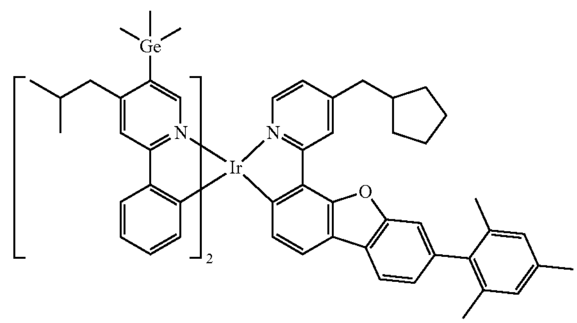
1159
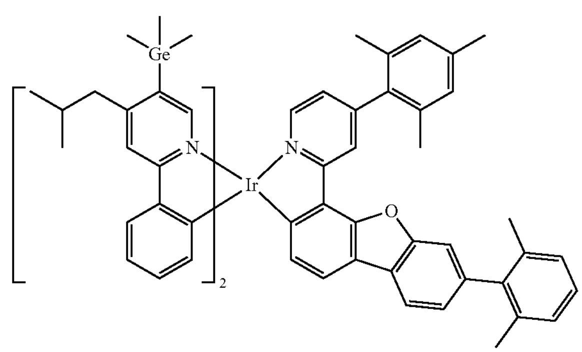
1160
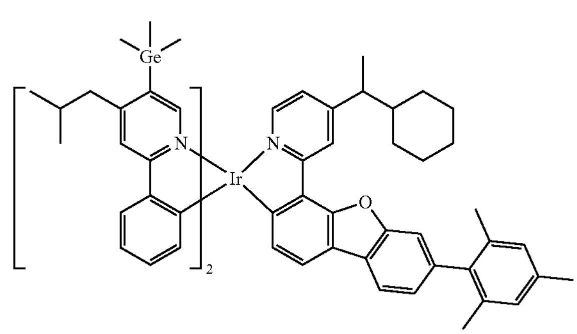

-continued
1161
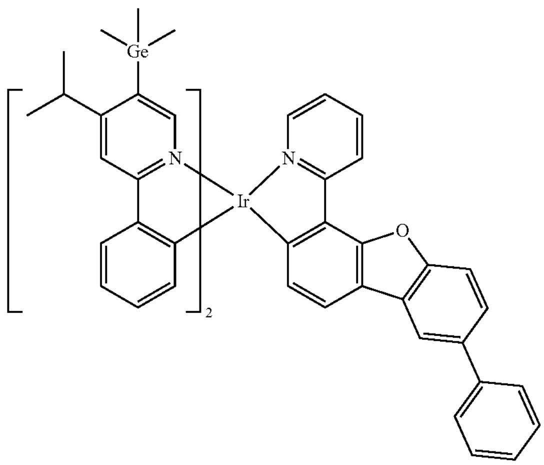
1162
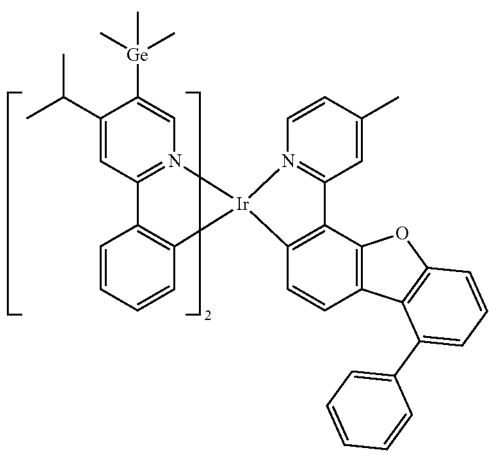
1163
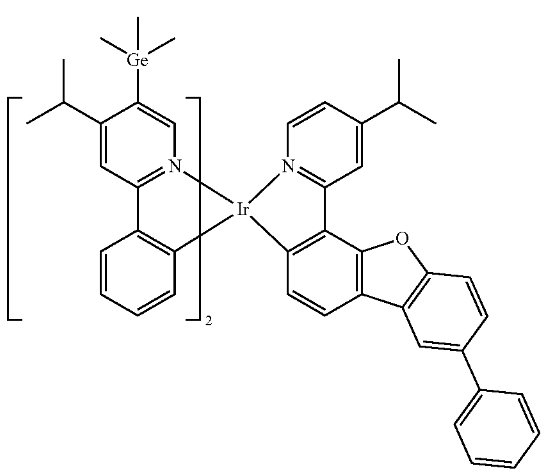
-continued
1164
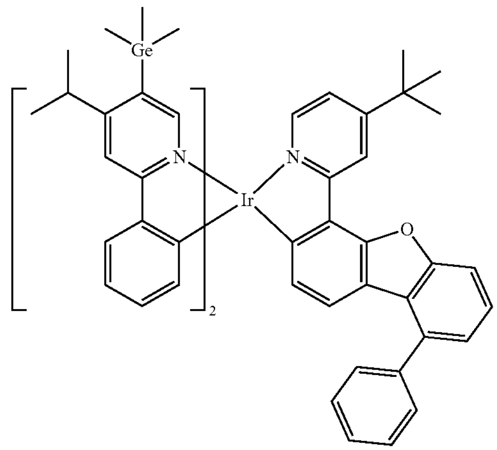
1165
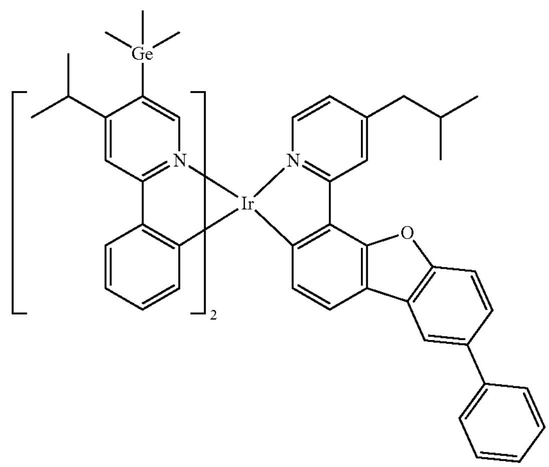
1166
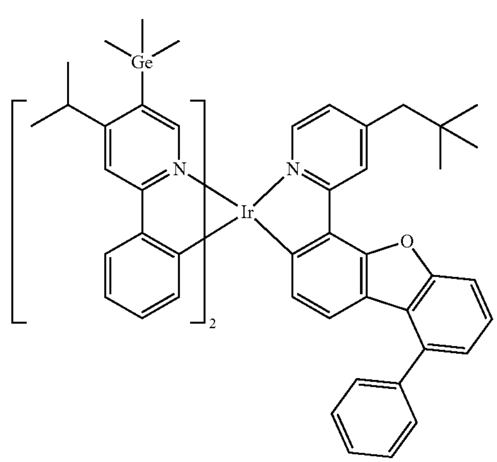

1167
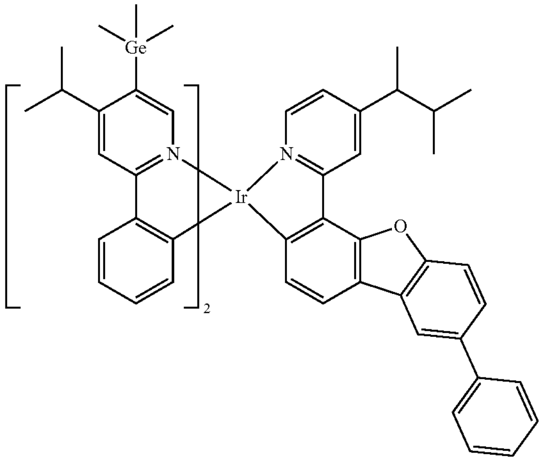
1168
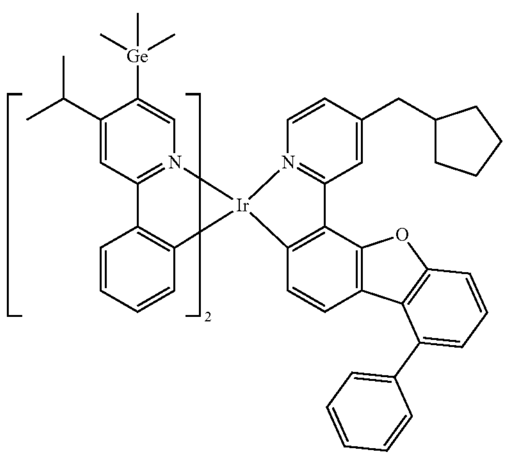
1169
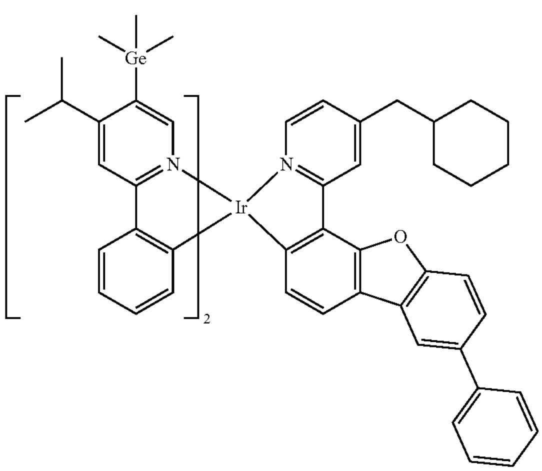
1170
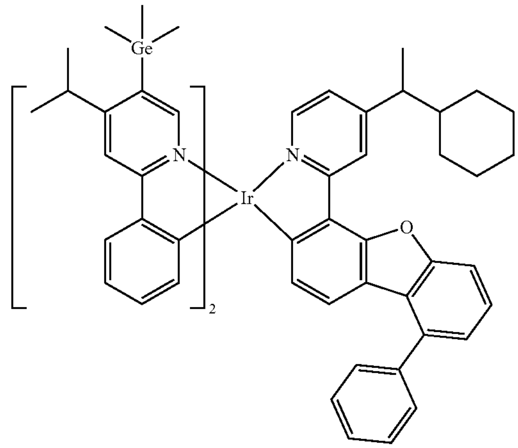
1171
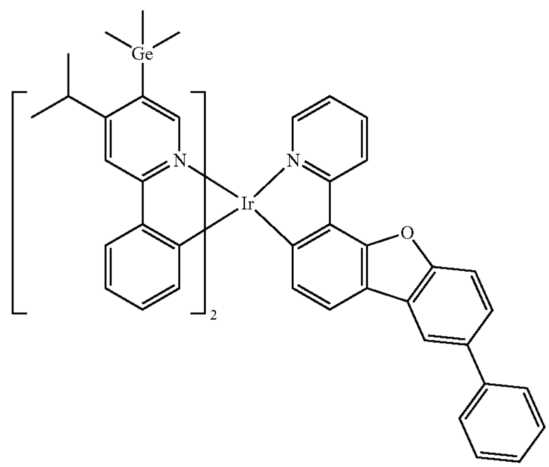
1172
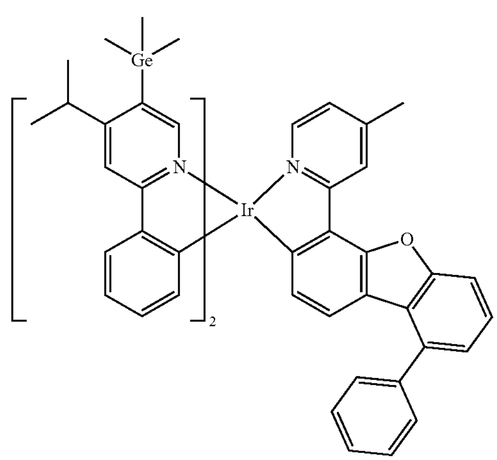

-continued
1173
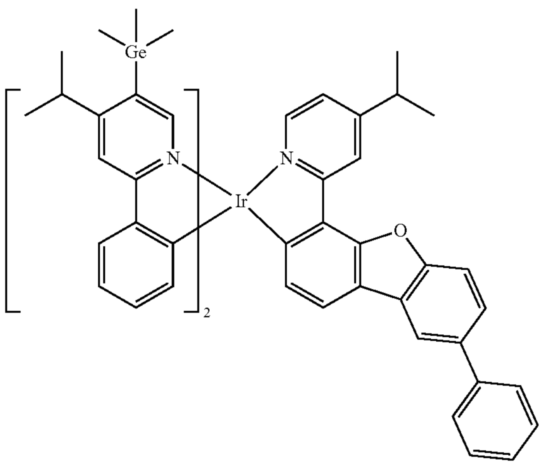
1174
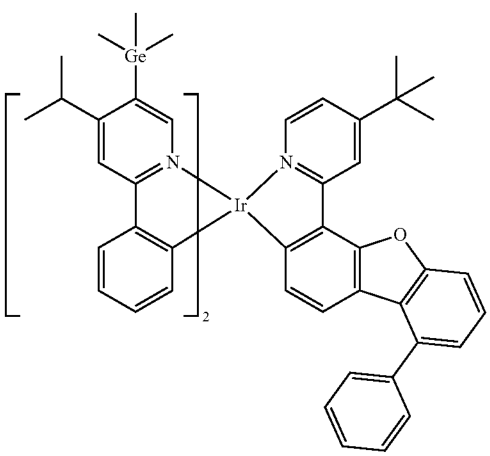
1175
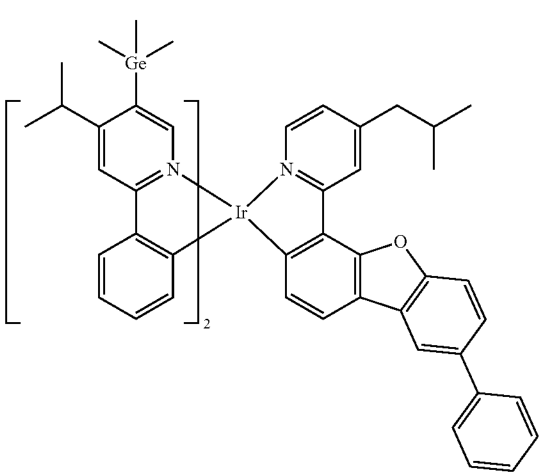
-continued
1176
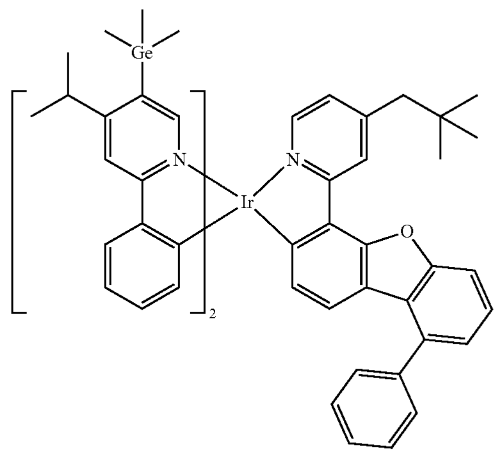
1177
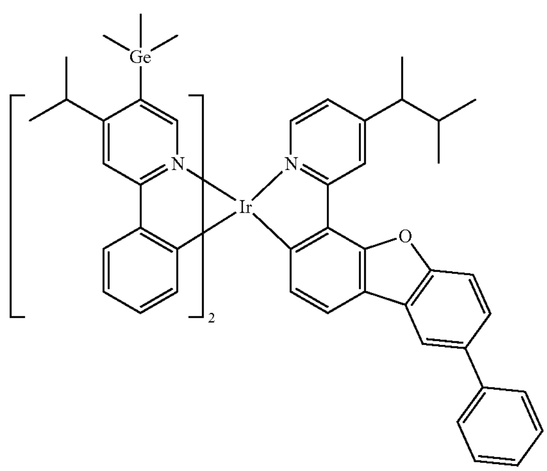
1178
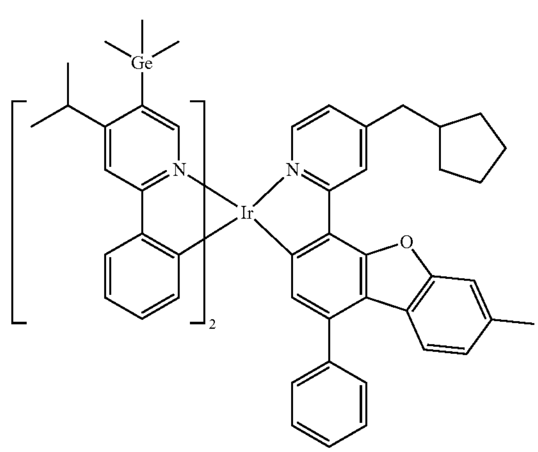

1179
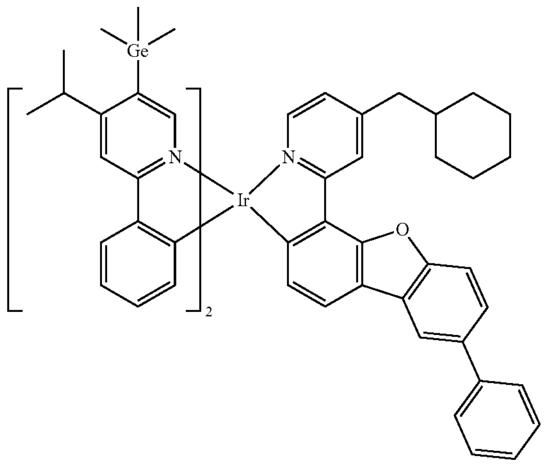
1180
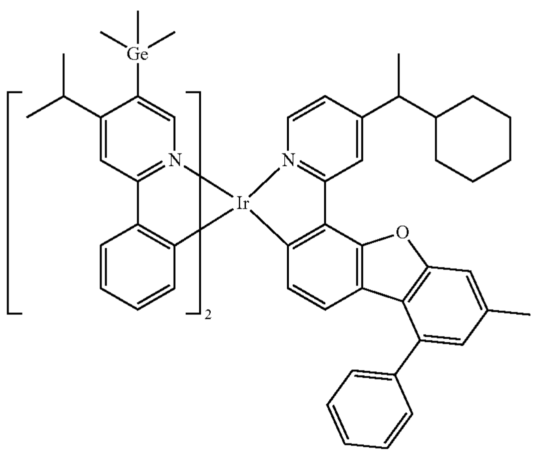
1181
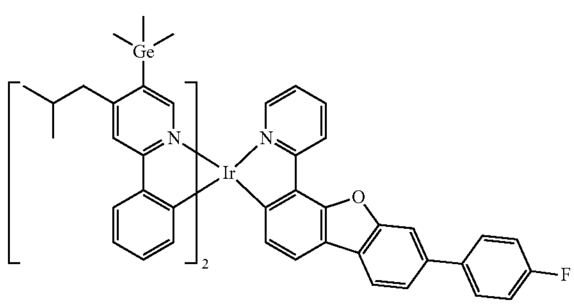
1182
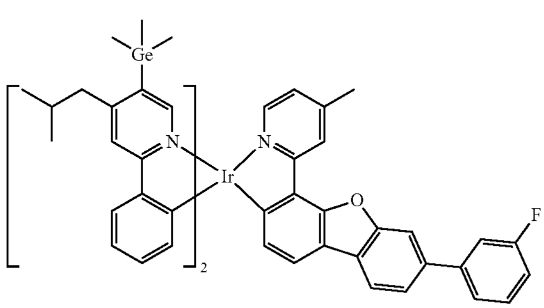
1183
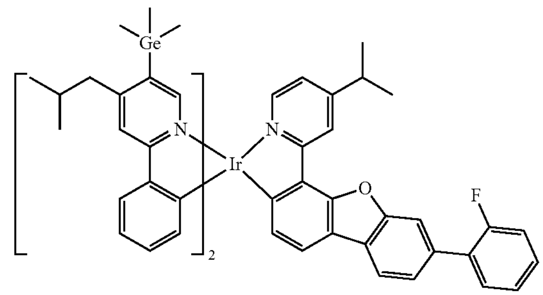
1184
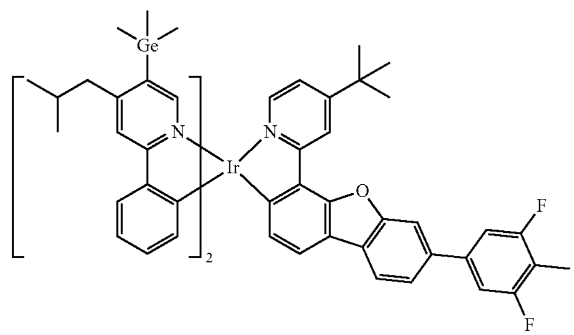
1185
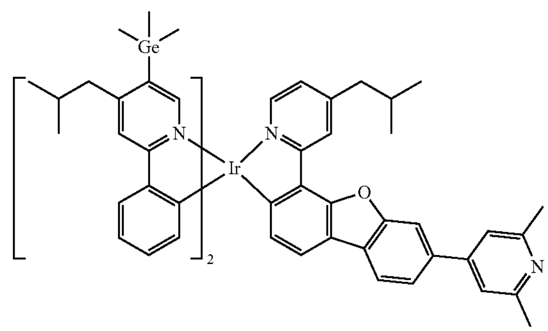
1186
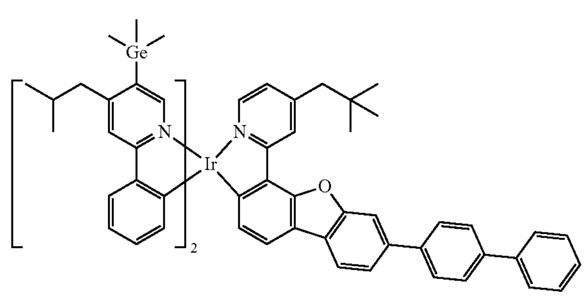
1187
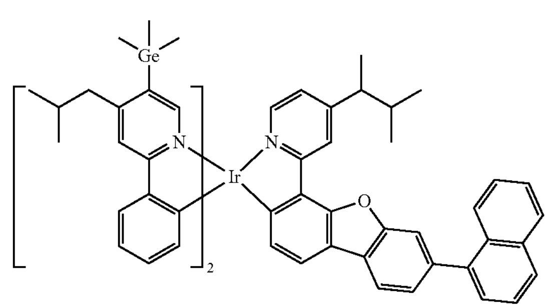

-continued
1188
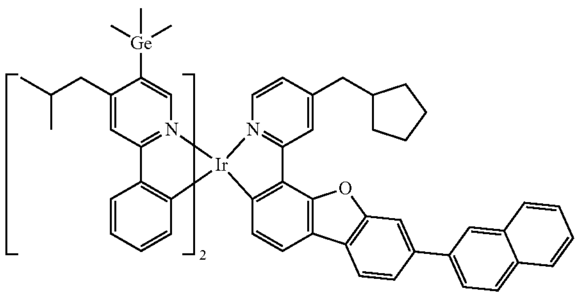
1189
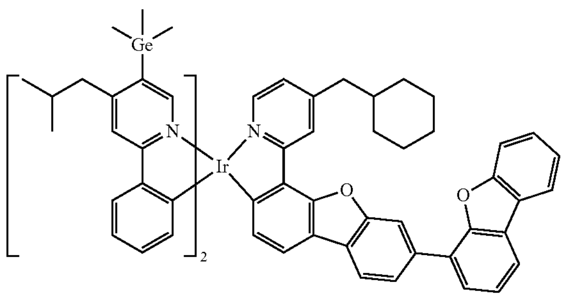
1190
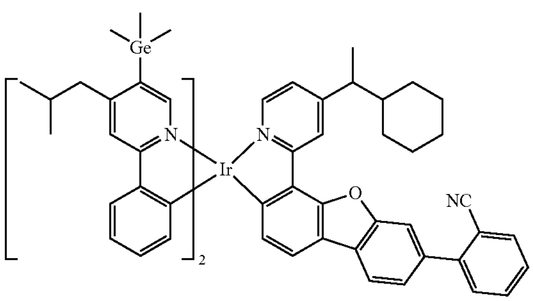
1191
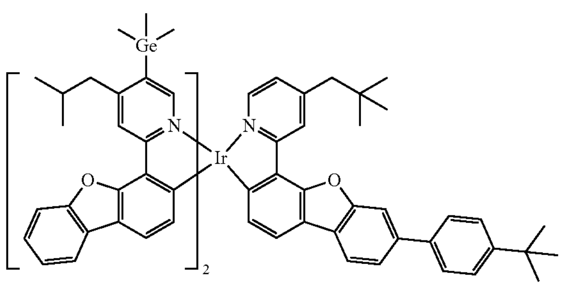
1192
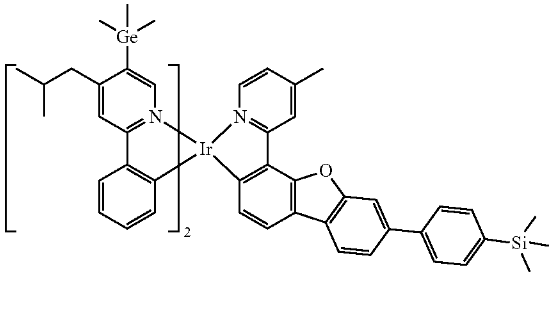
-continued
1193
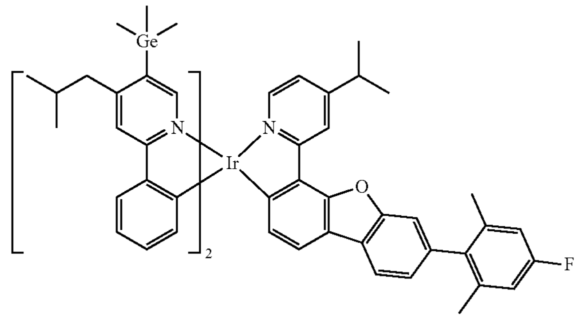
1194
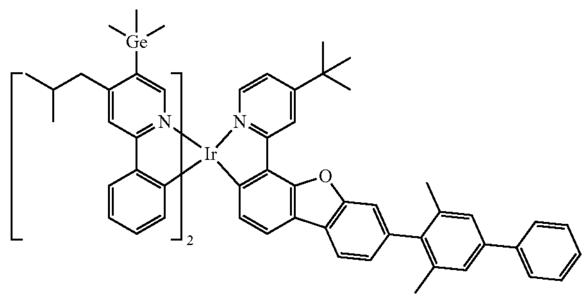
1195
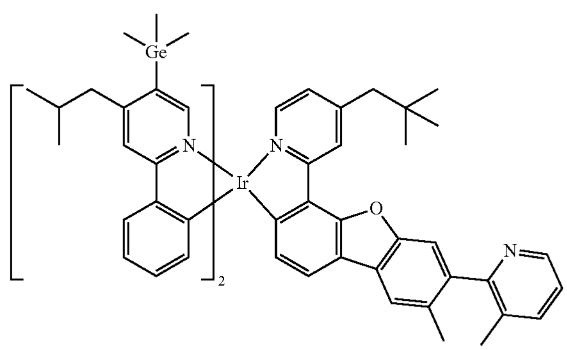
1196
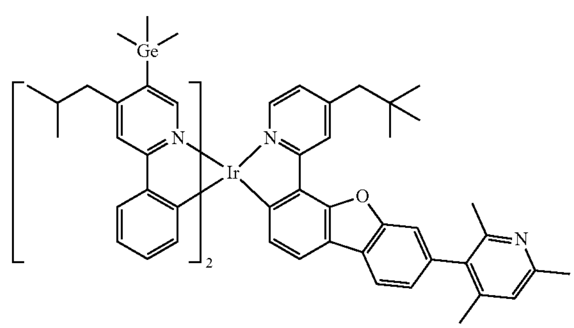

-continued
1197
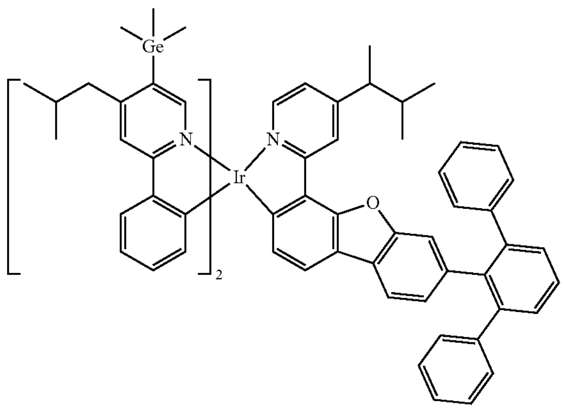
1198
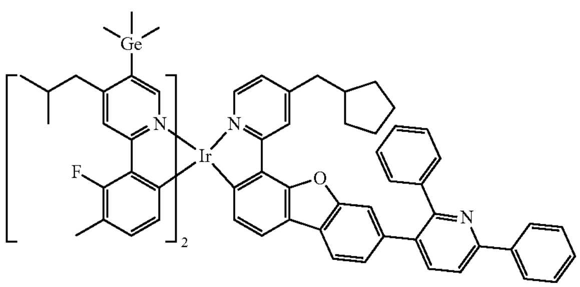
1199
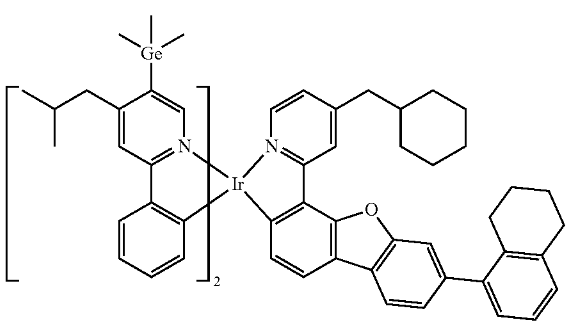
1200
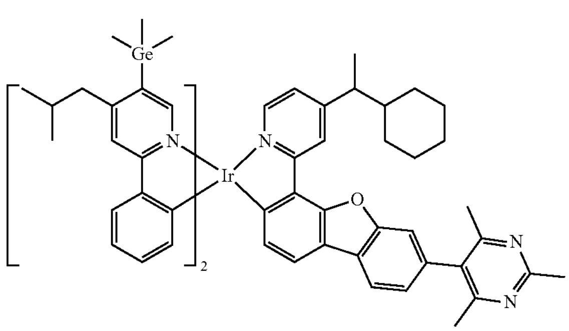
-continued
1201
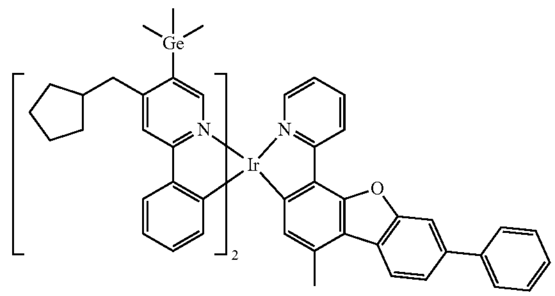
1202
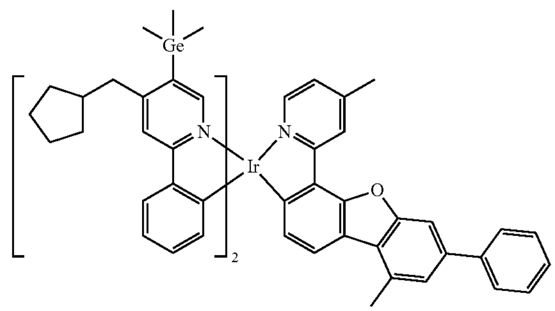
1203
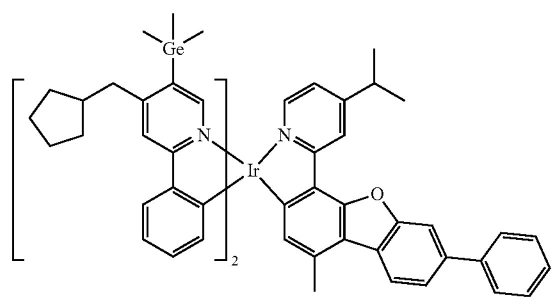
1204
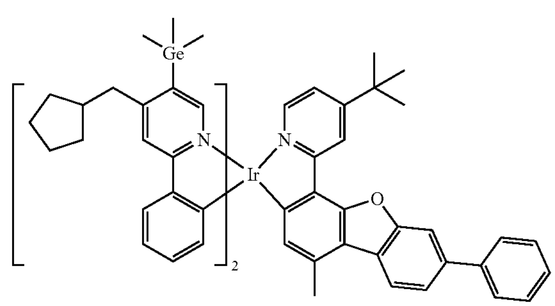
1205
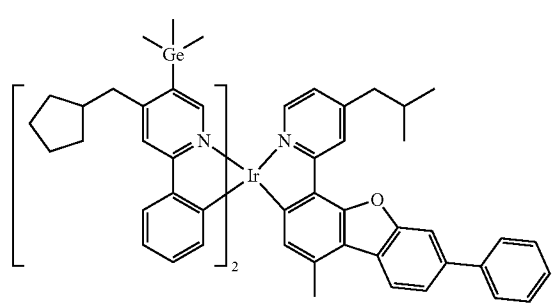

1206
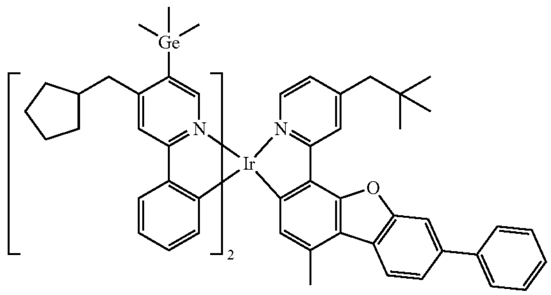
1207
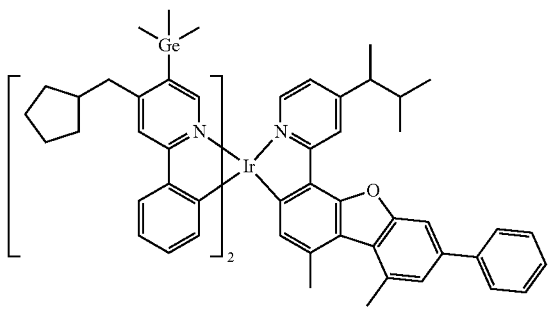
1208
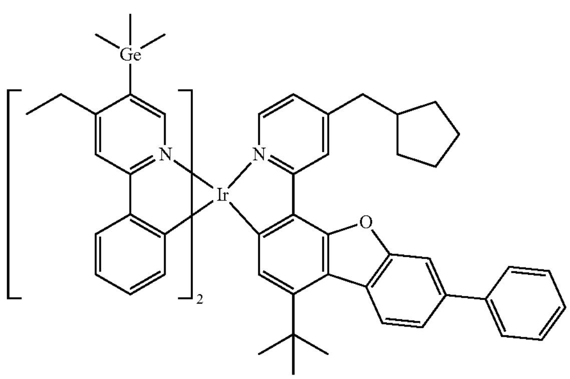
1209
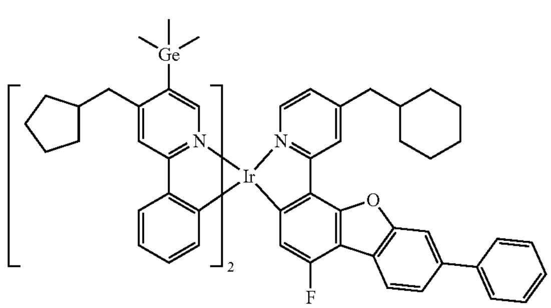
1210
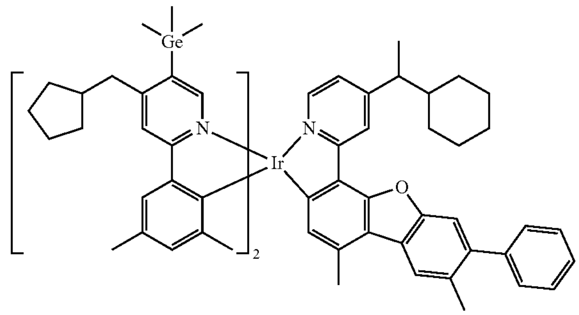
1211
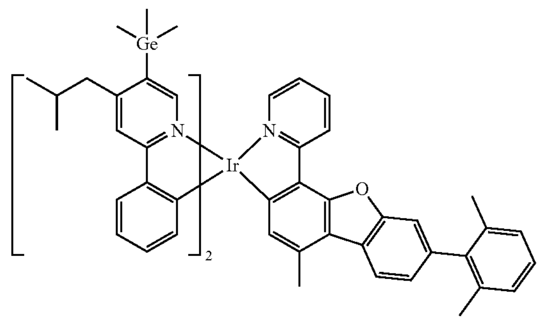
1212
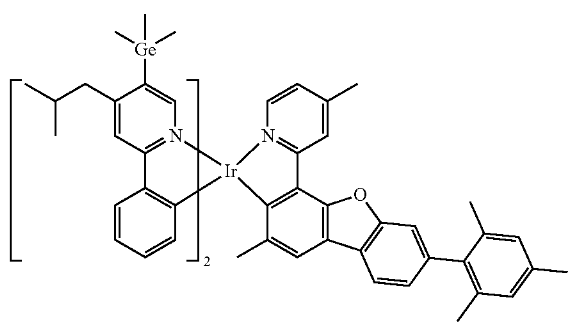
1213
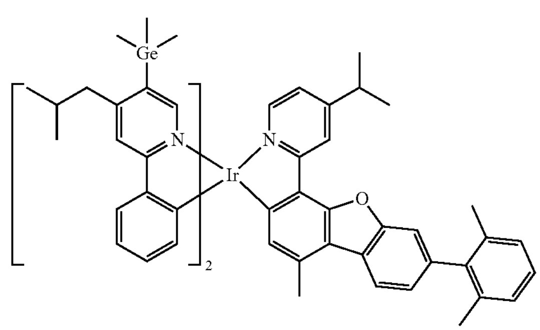

-continued
1214
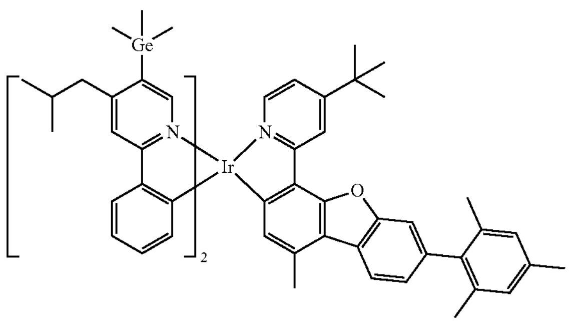
1215
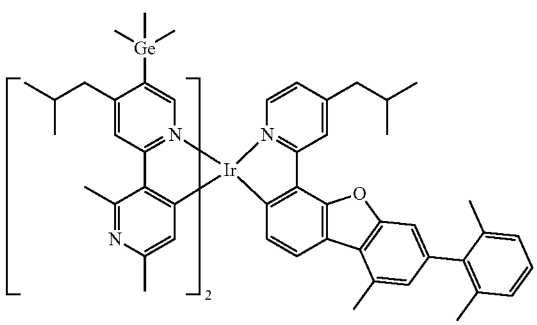
1216
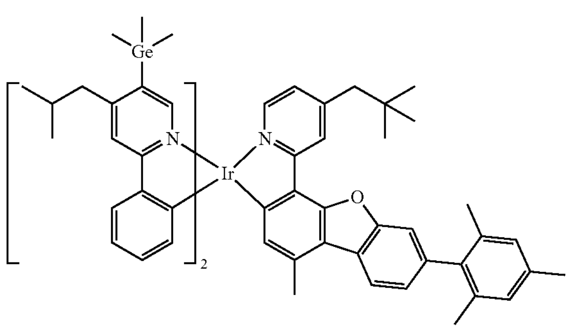
1217
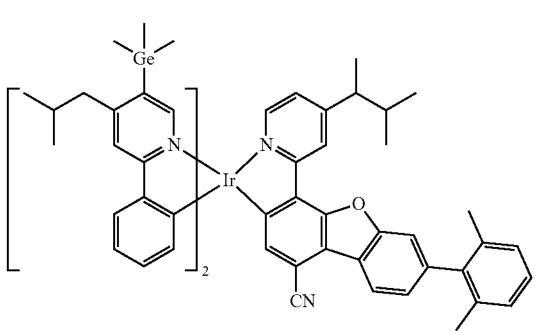
-continued
1218
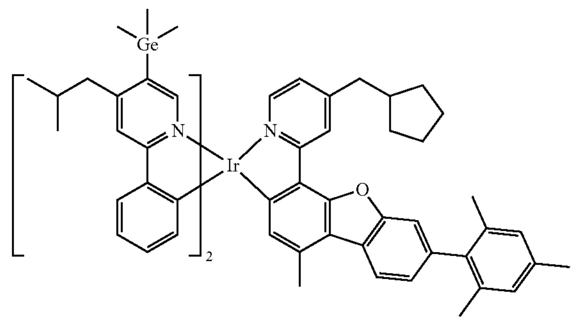
1219
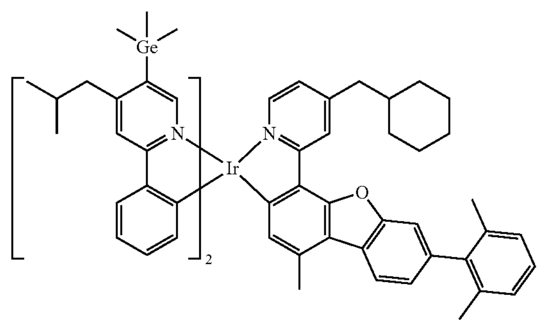
1220
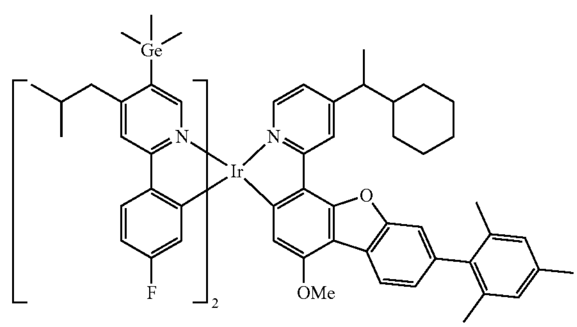
1221
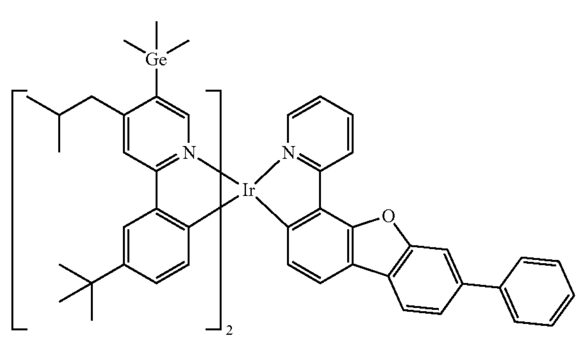

1222
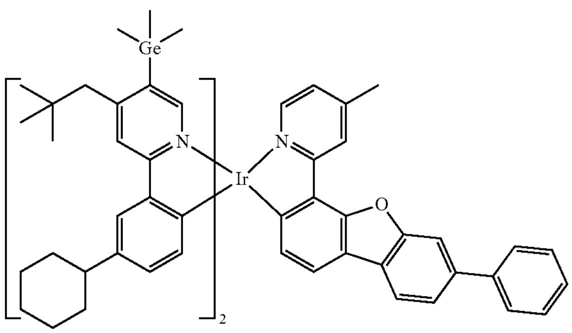
1223
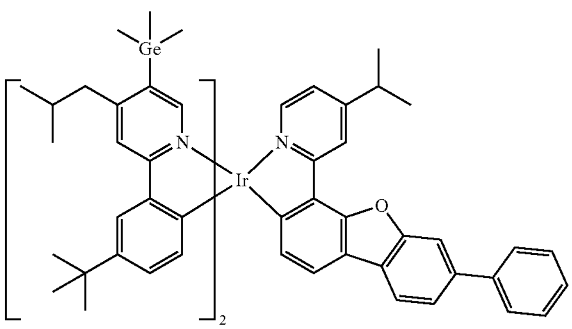
1224
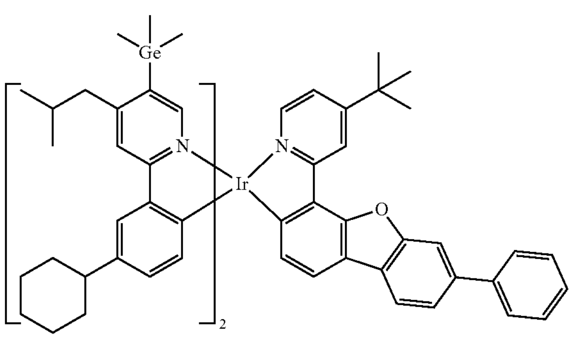
1225
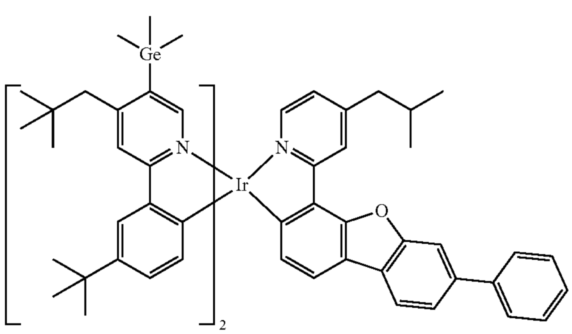
1226
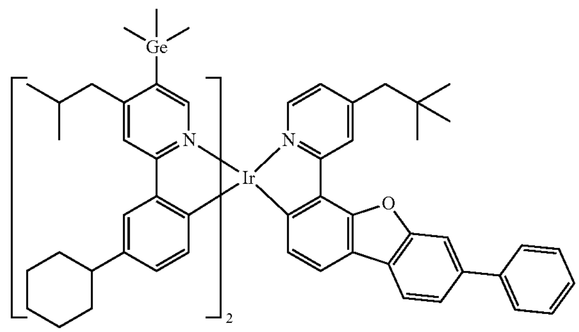
1227
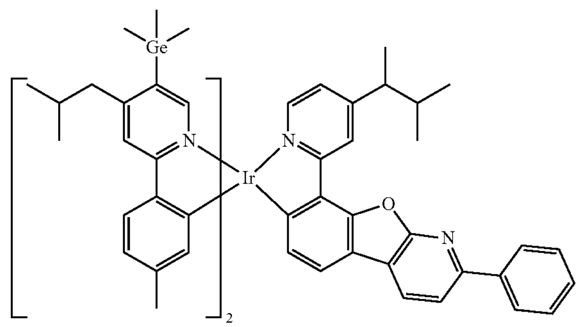
1228
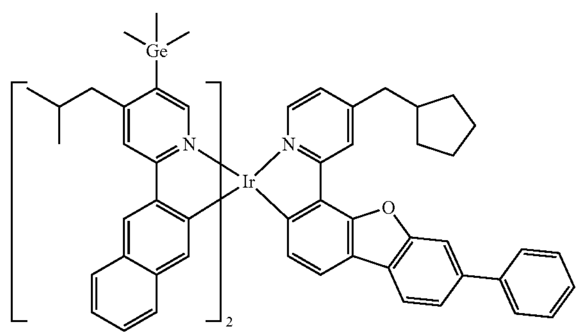
1229
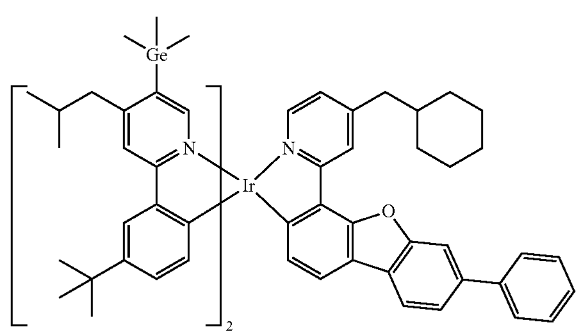

-continued
1230
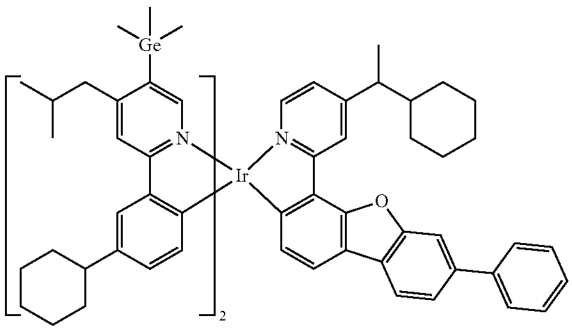
1231
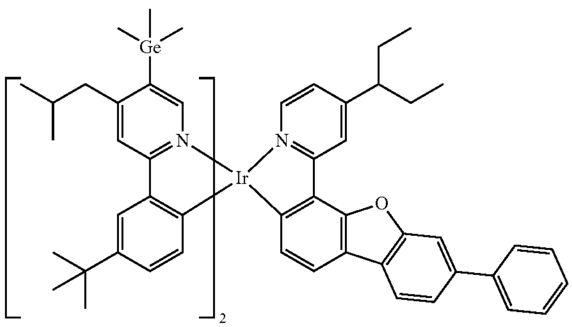
1232
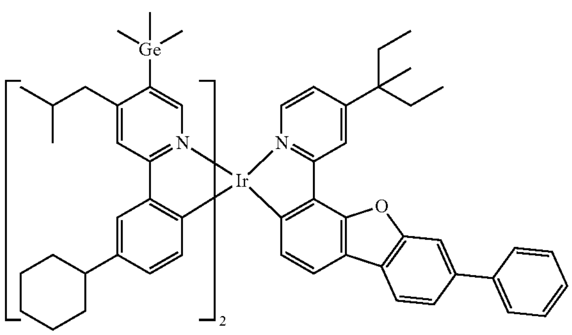
1233
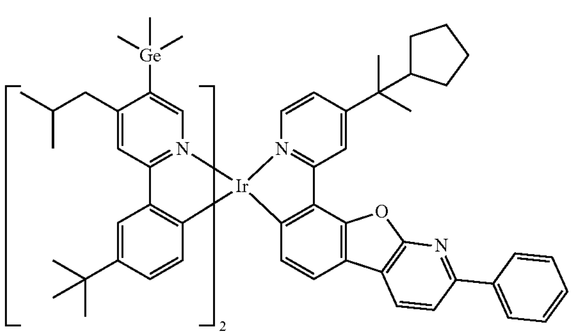
-continued
1234
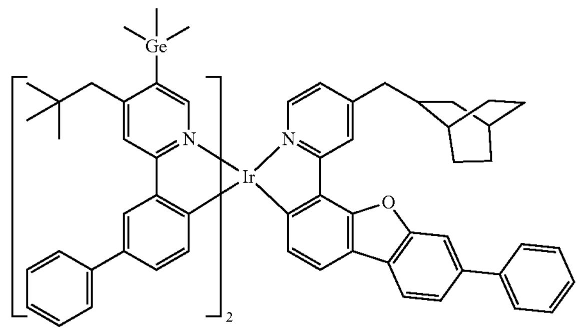
1235
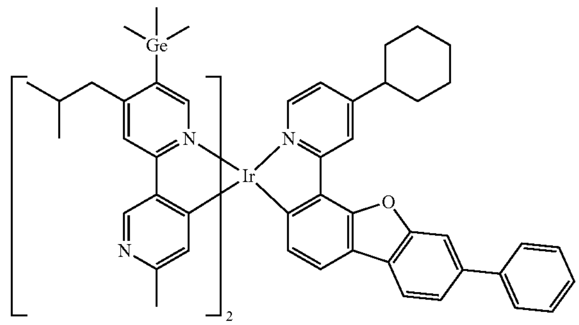
1236
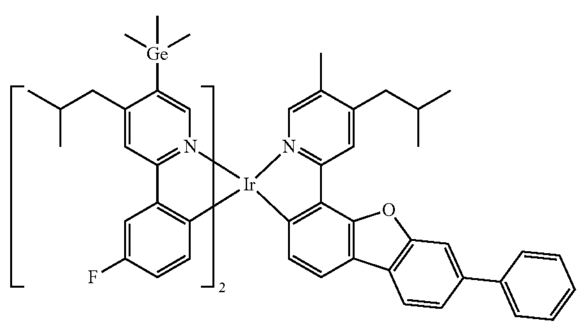
1237
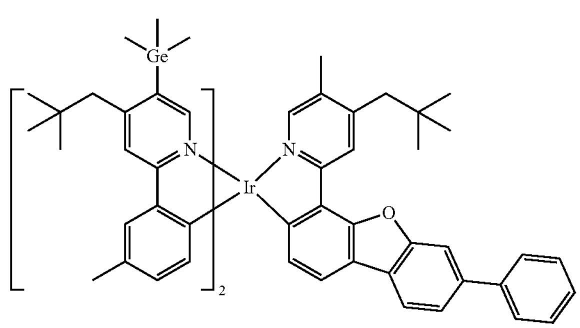

-continued
1238
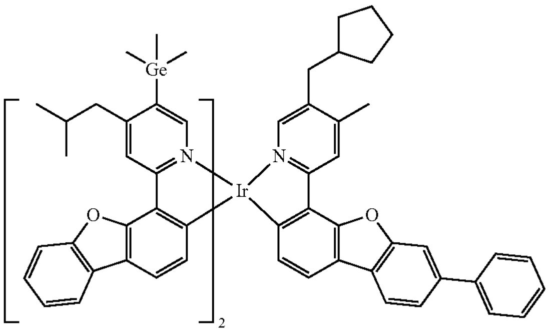
1239
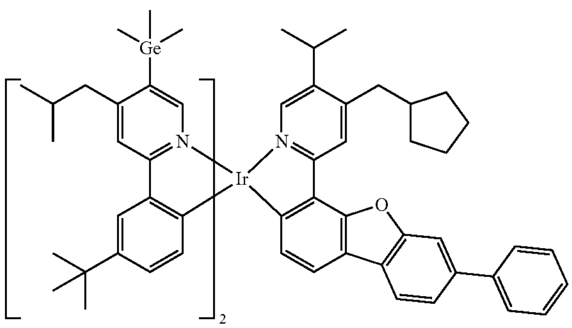
1240
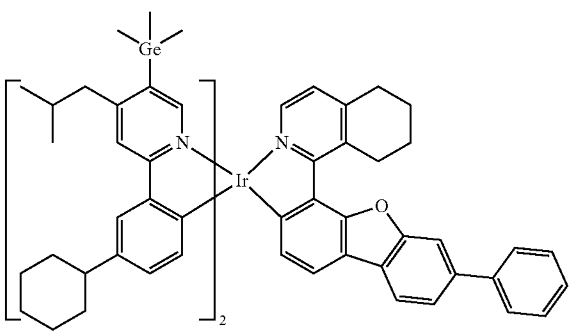
1241
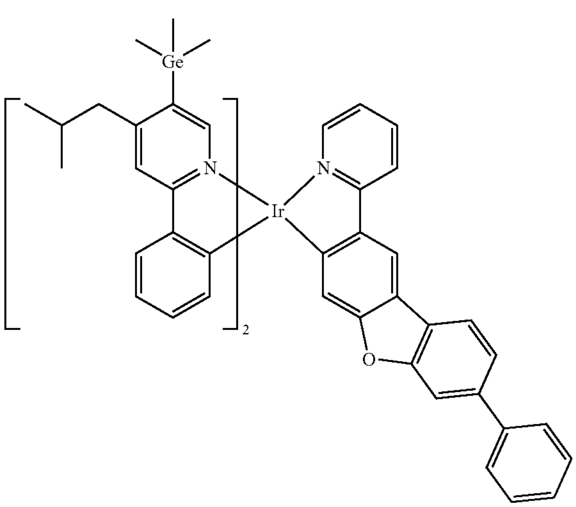
-continued
1242
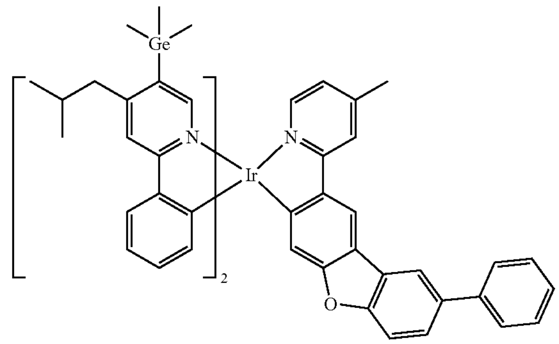
1243
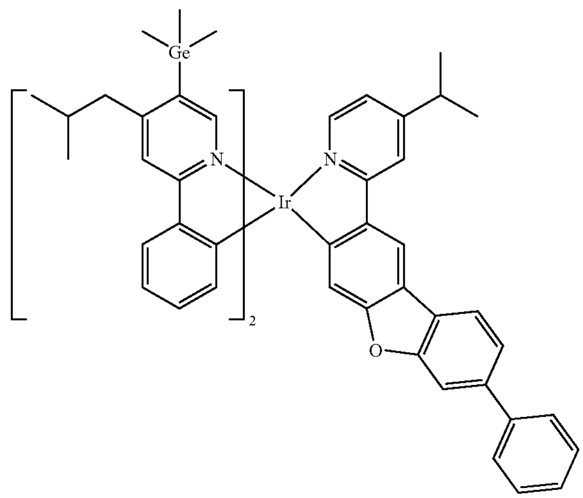
1244
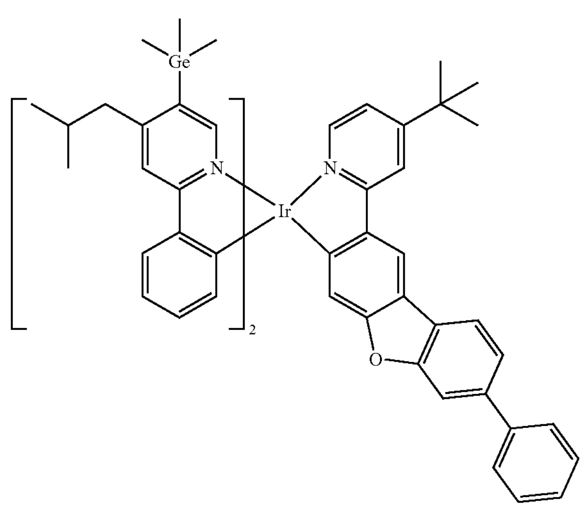

-continued
1245
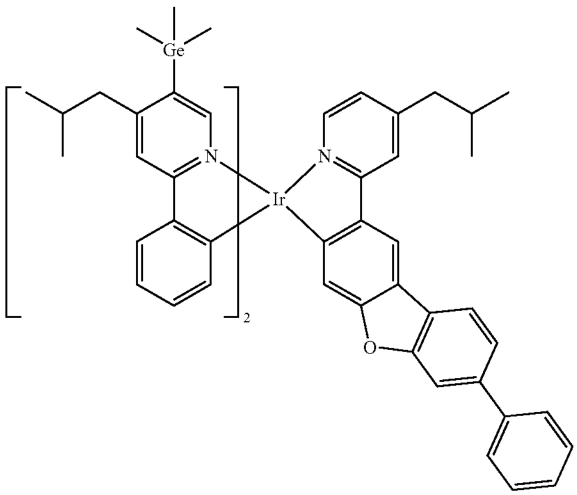
1246
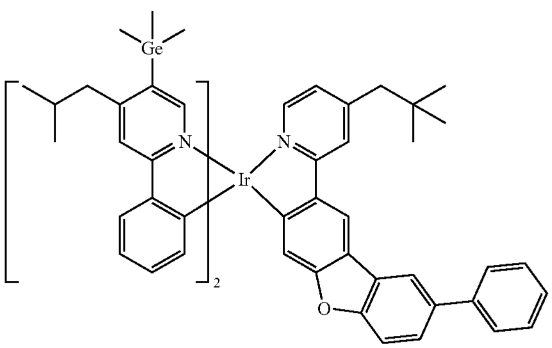
1247
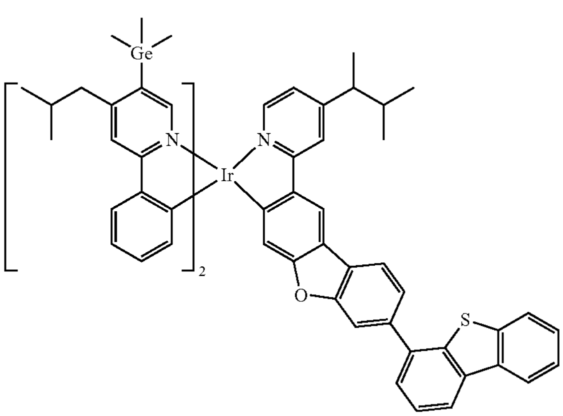
-continued
1248
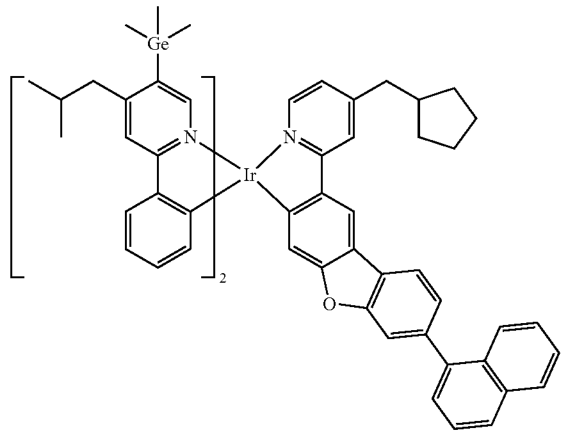
1249
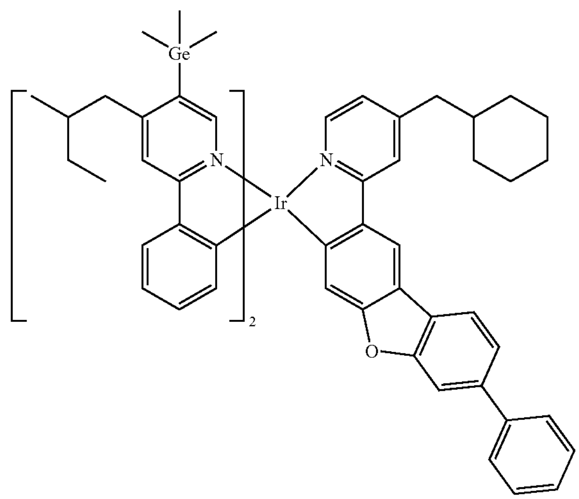
1250
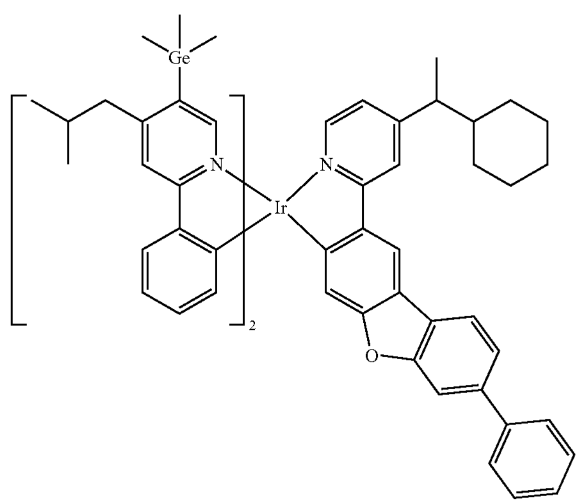

-continued
1251
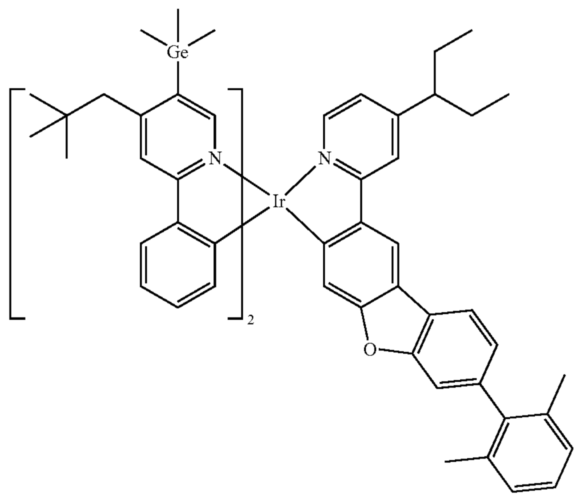
1252
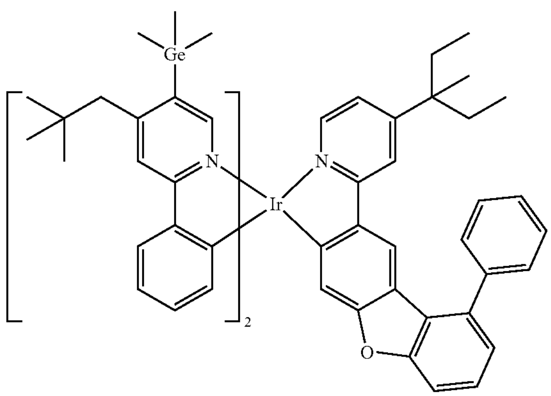
1253
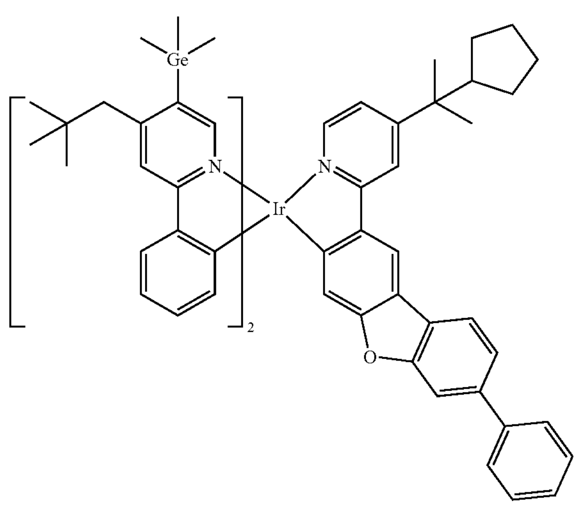
-continued
1254
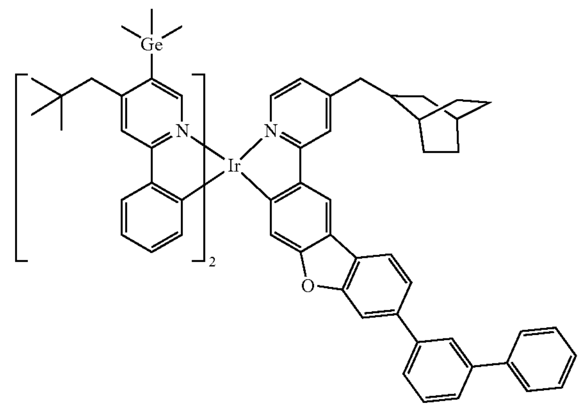
1255
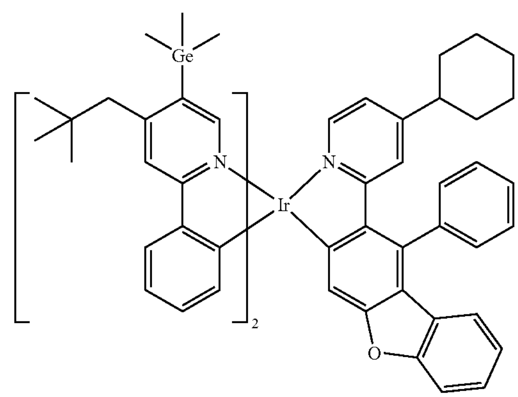
1256
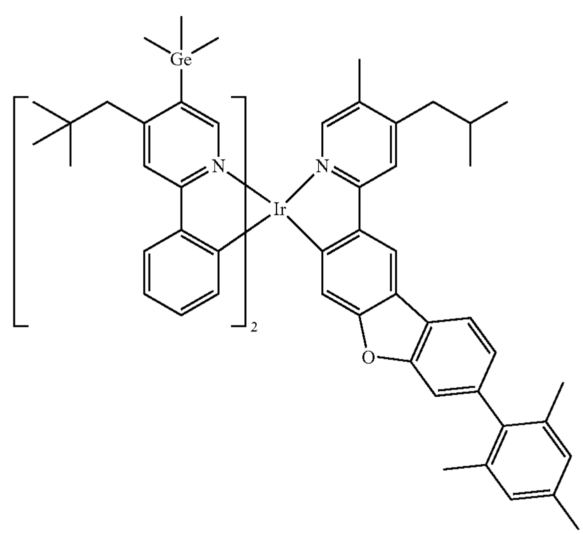

1257
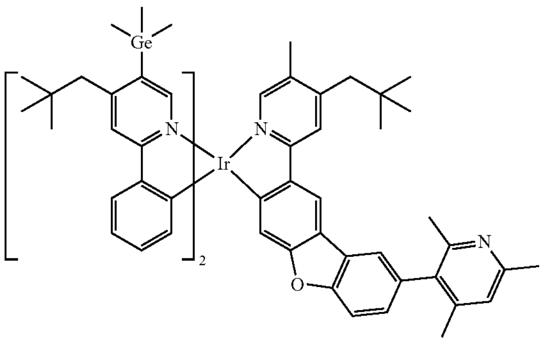
1258
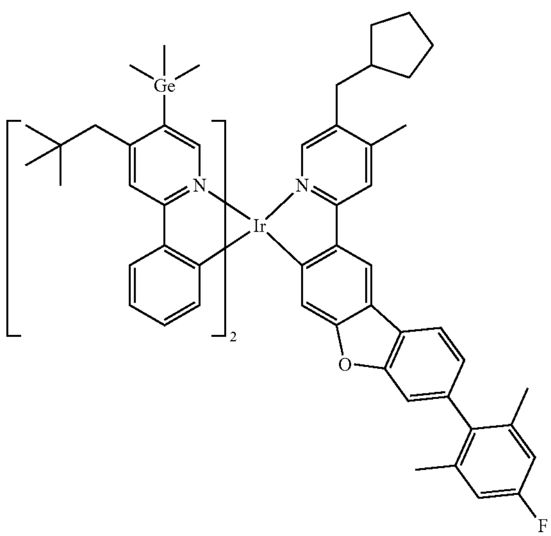
1259
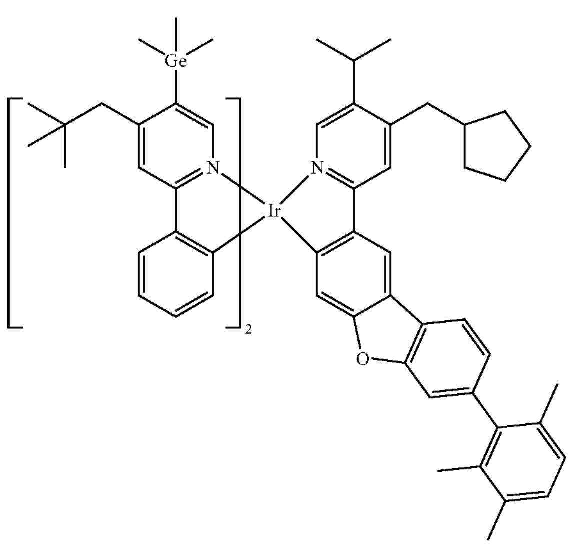
1260
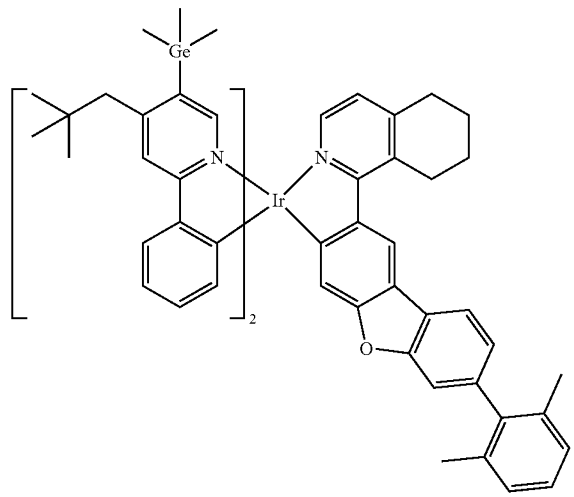
1261
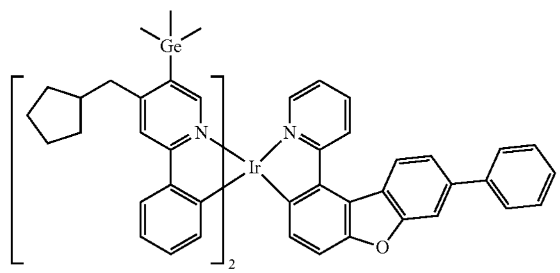
1262
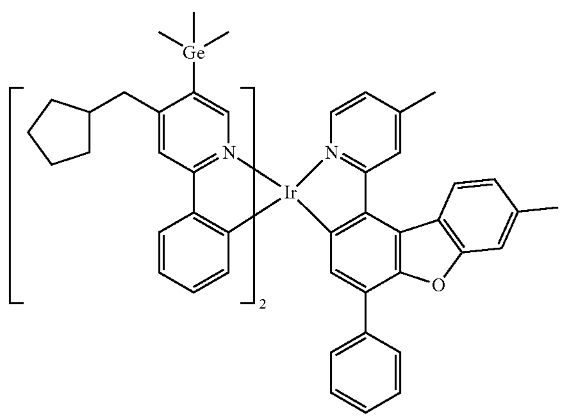
1263
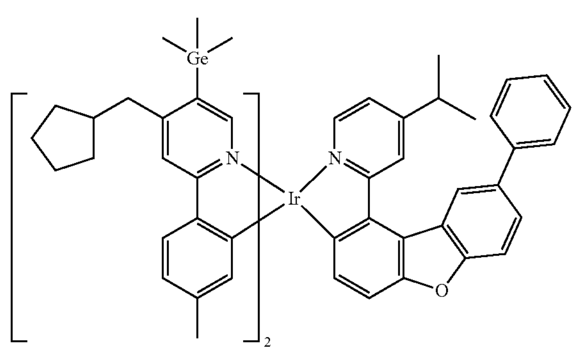

-continued
1264
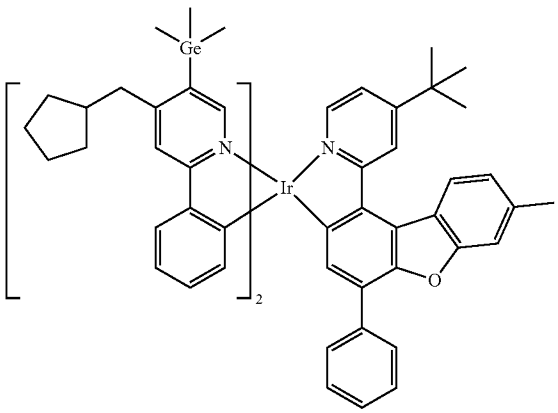
1265
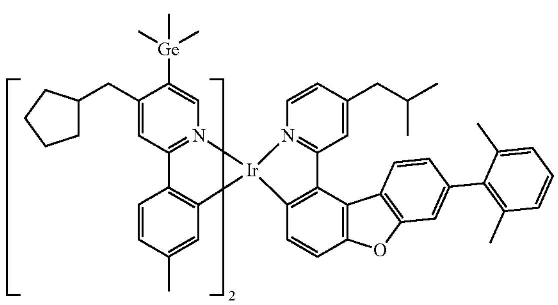
1266
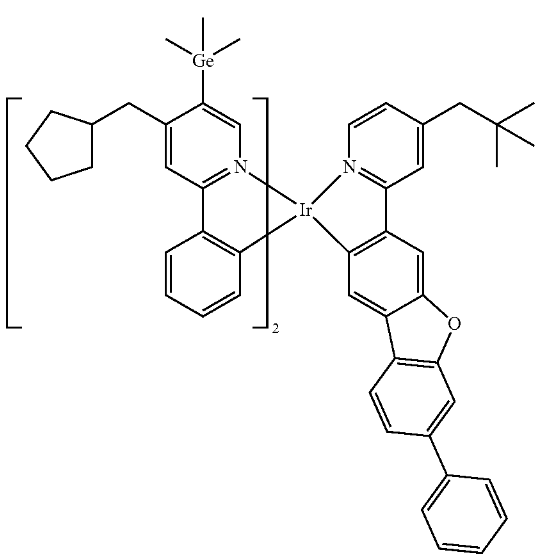
-continued
1267
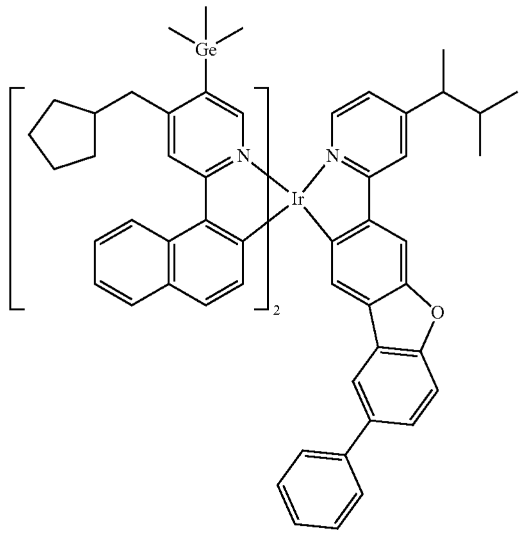
1268
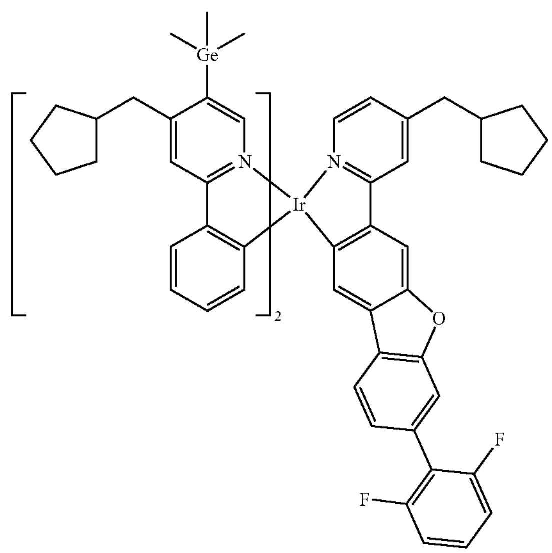
1269
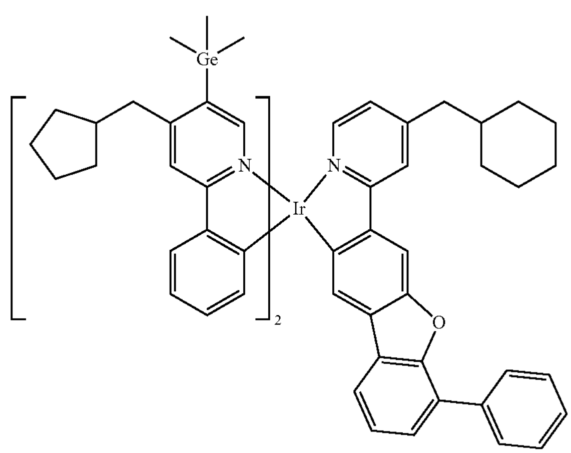

-continued
1270
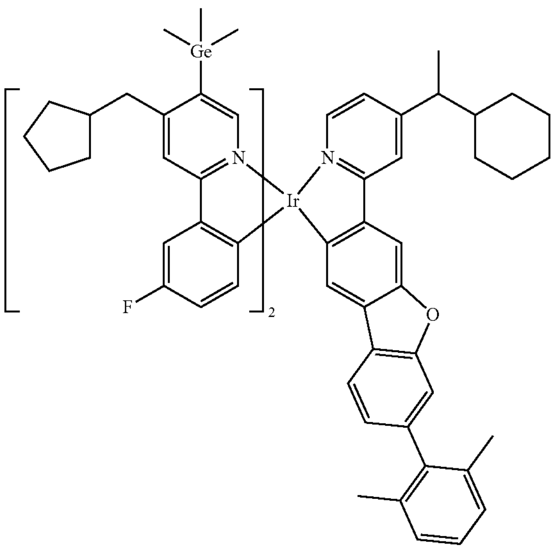
1271
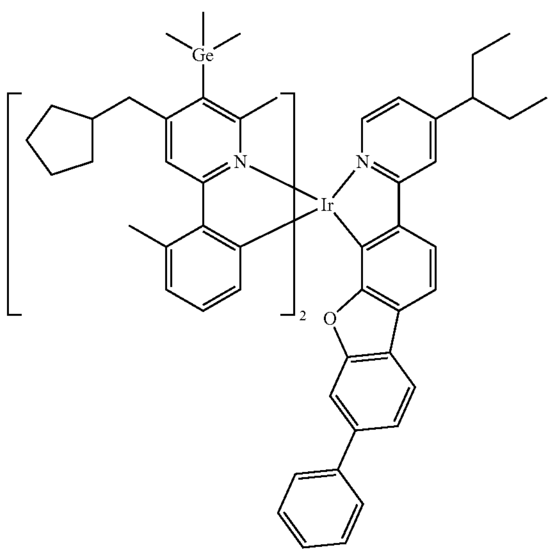
1272
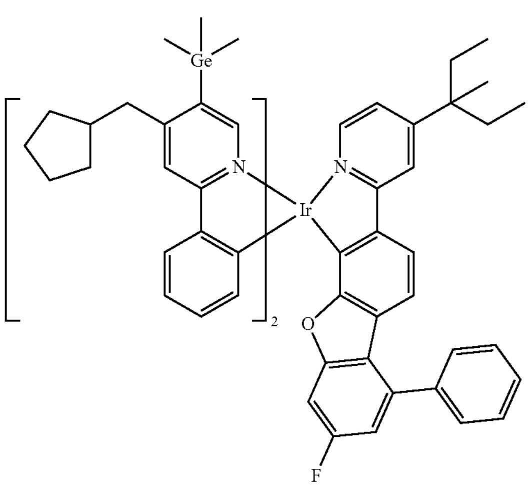
-continued
1273
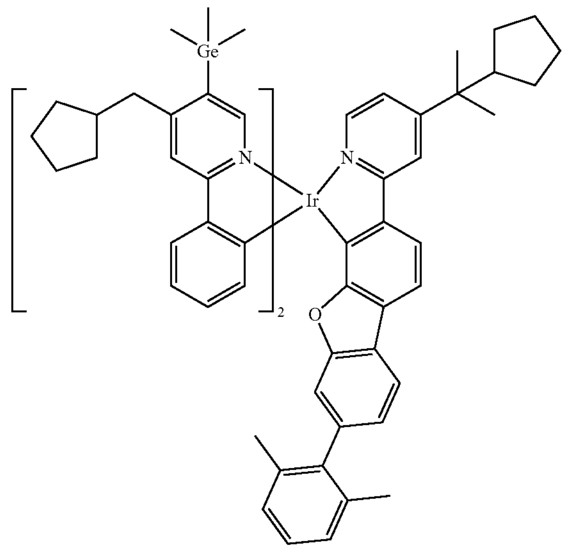
1274
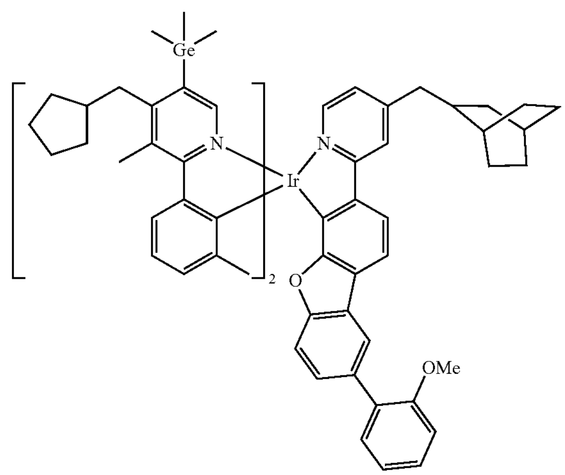
1275
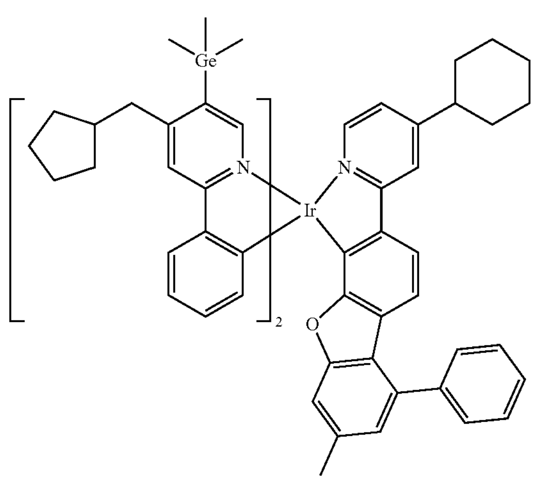

-continued
1276
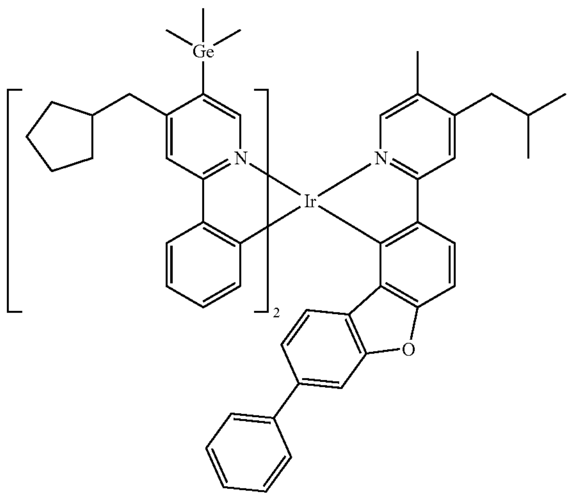
1277
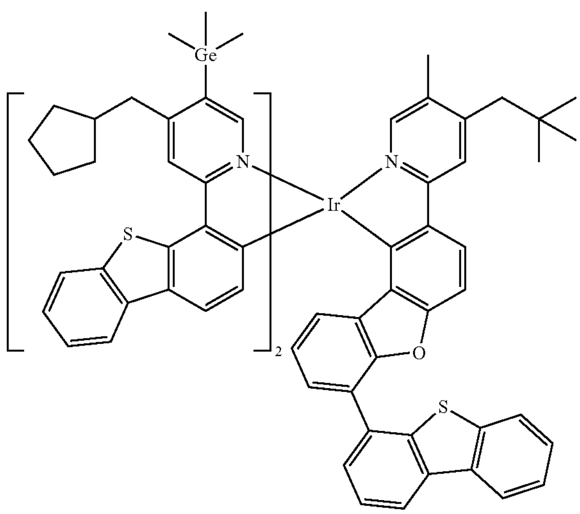
1278
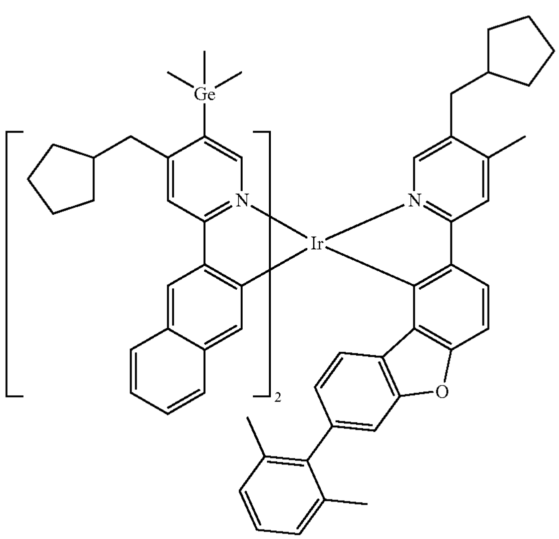
-continued
1279
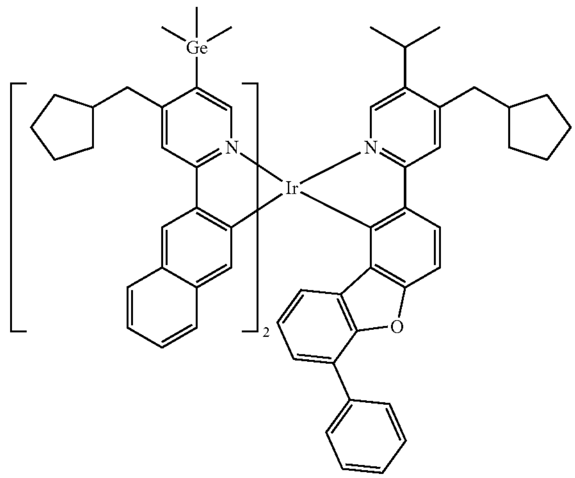
1280
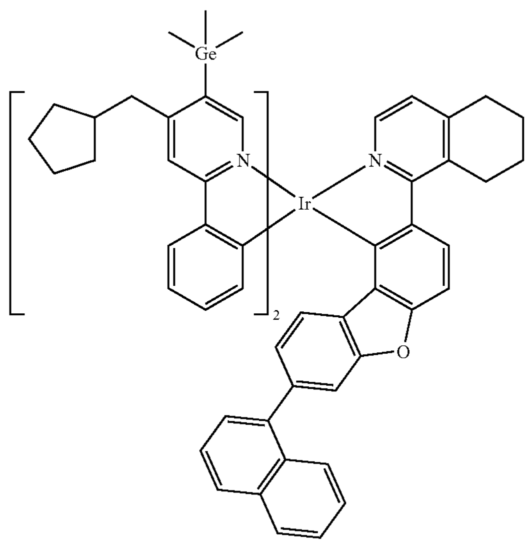
1281
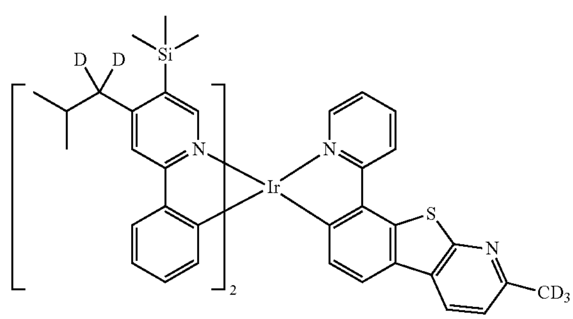

1282
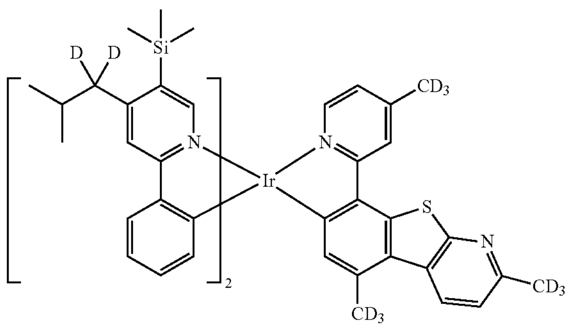
1283
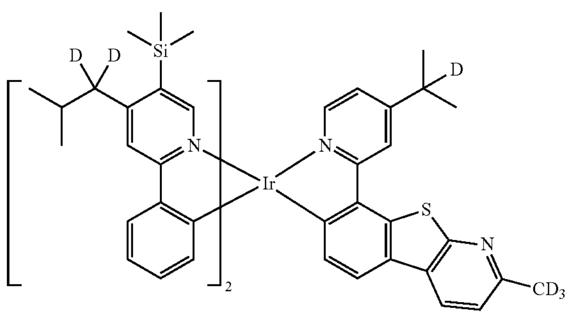
1284
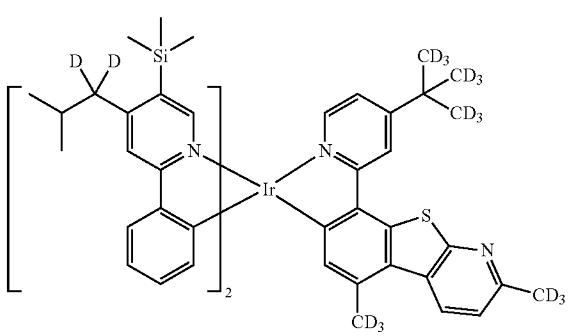
1285
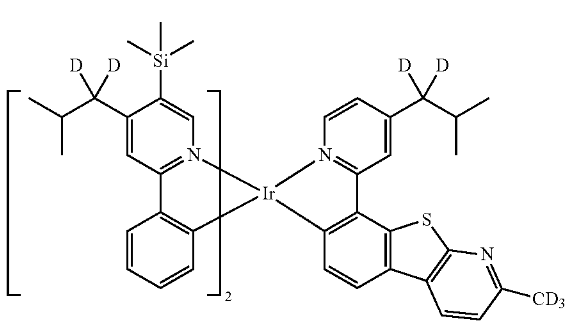
1286
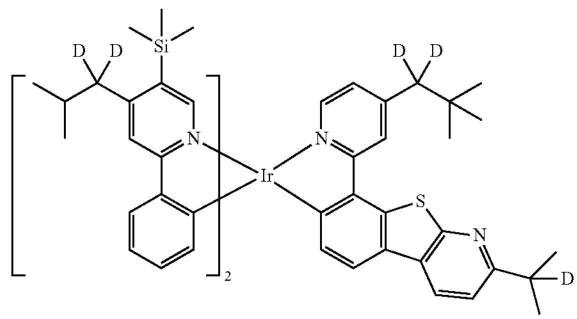
1287
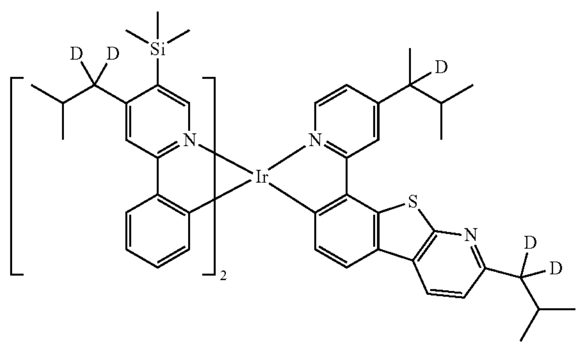
1288
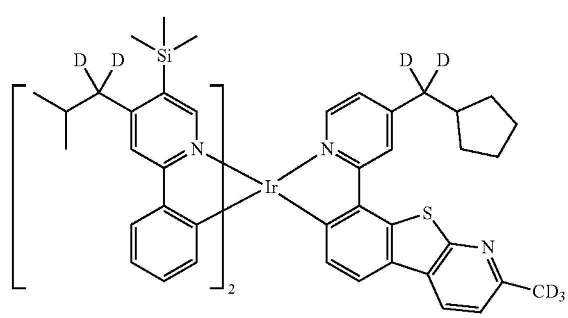
1289
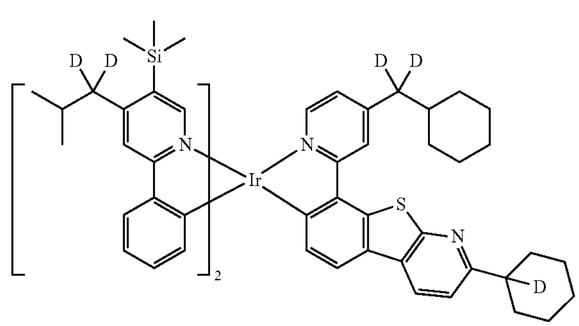

1290
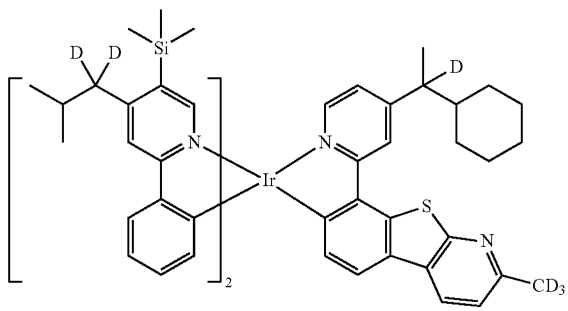
1291
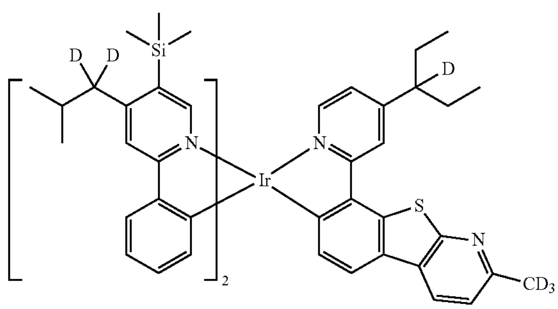
1292
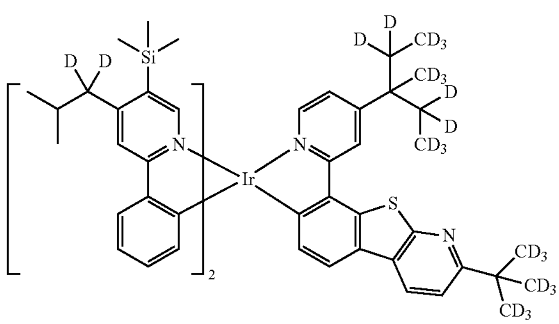
1293
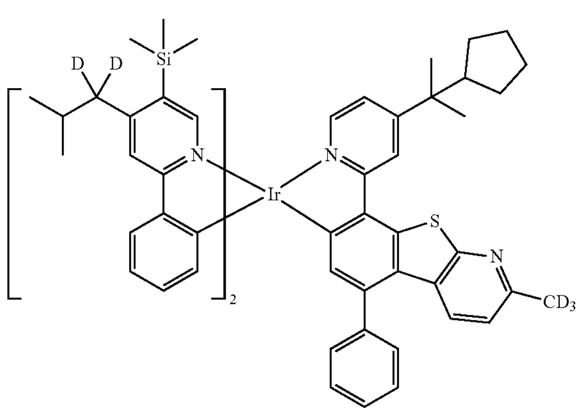
1294
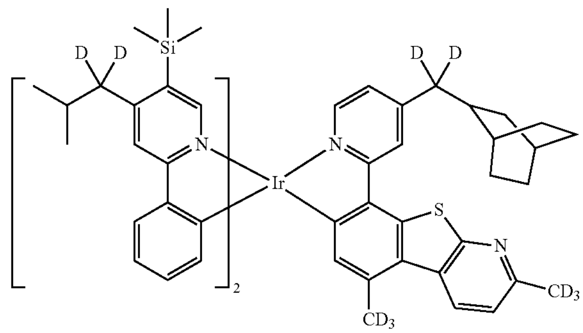
1295
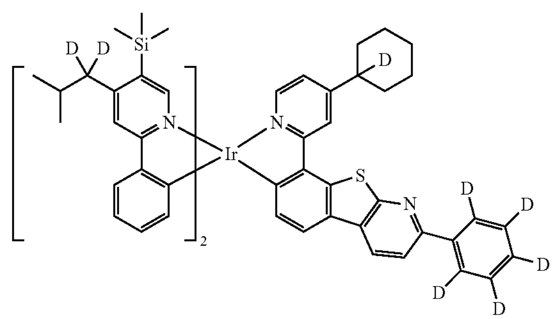
1296
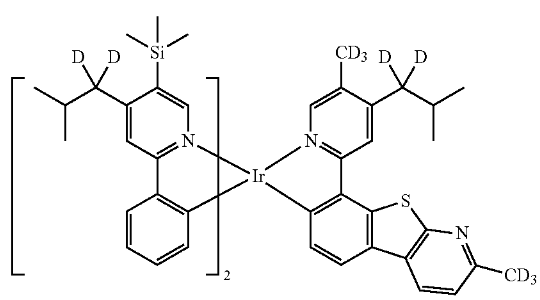
1297
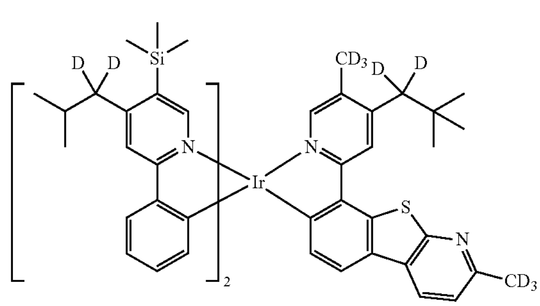

-continued
1298
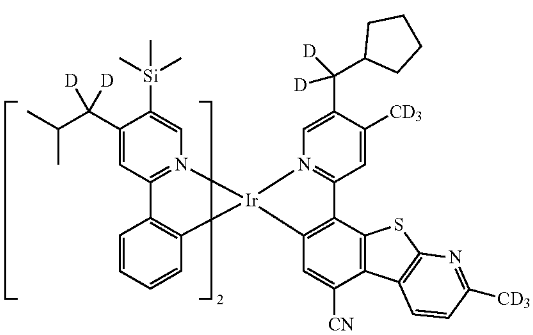
1299
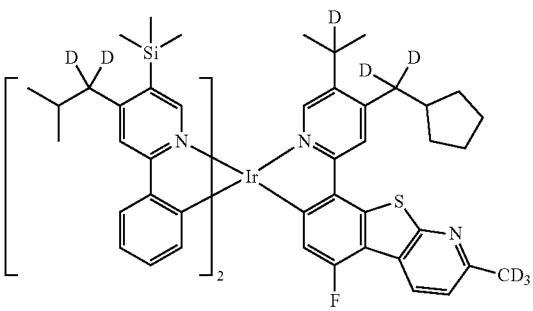
1300
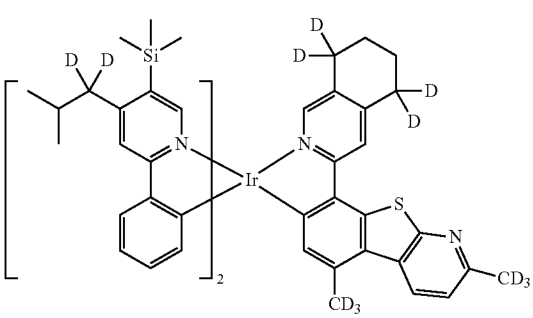
1301
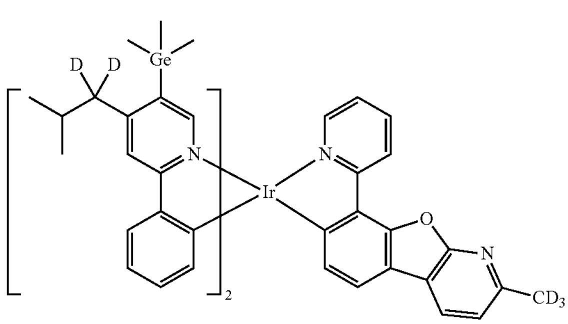
-continued
1302
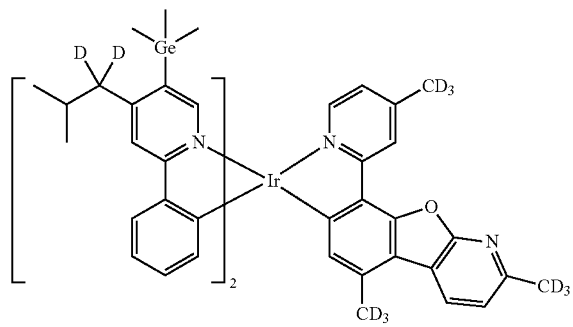
1303
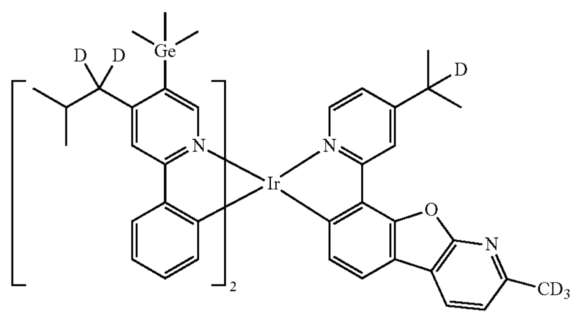
1304
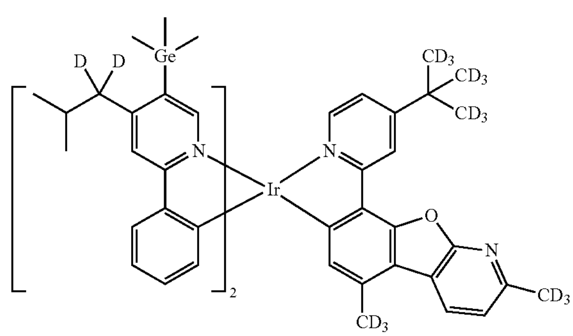
1305
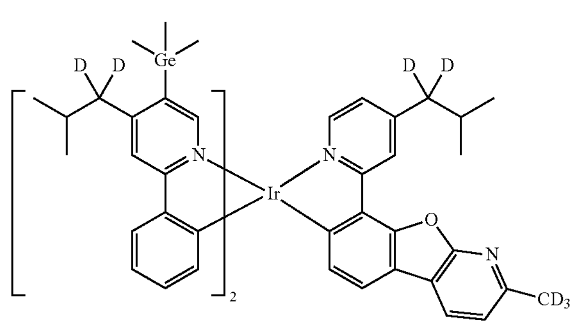

1306
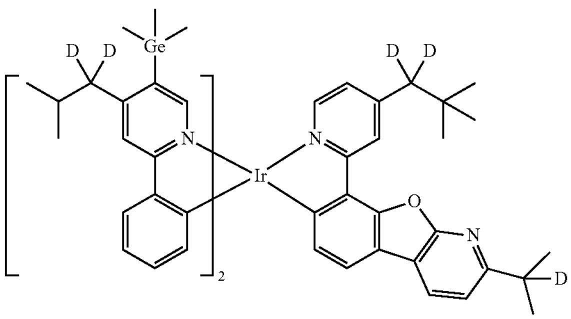
1307
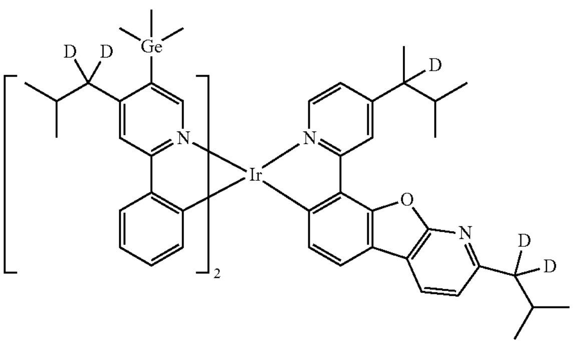
1308
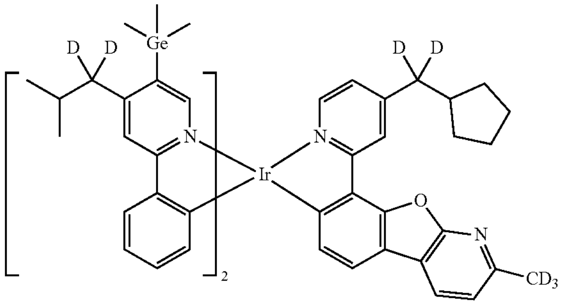
1309
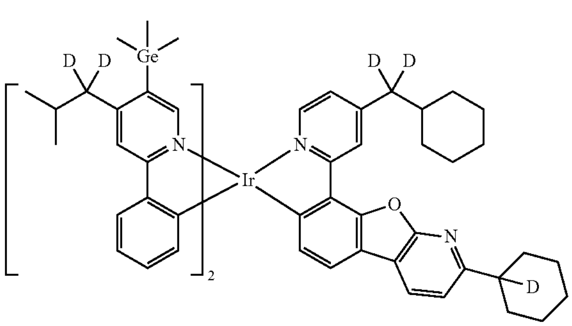
1310
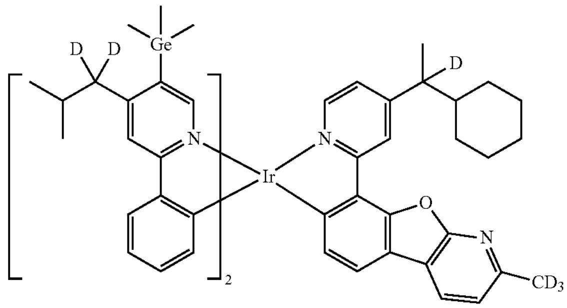
1311
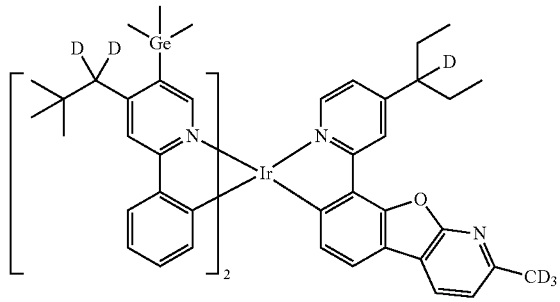
1312
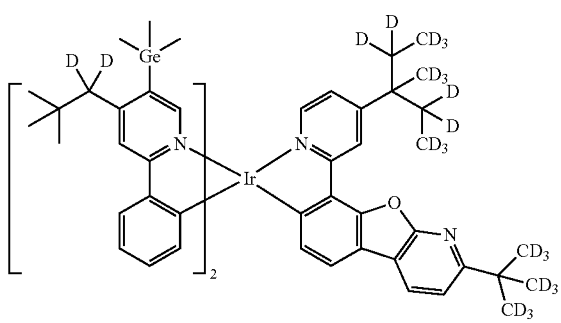
1313
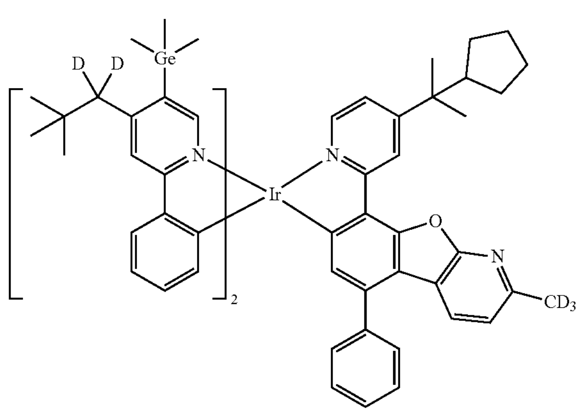

-continued
1314
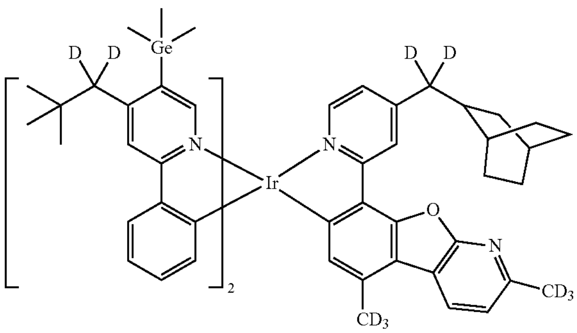
1315
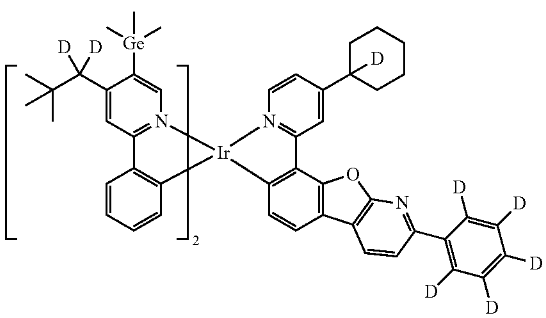
1316
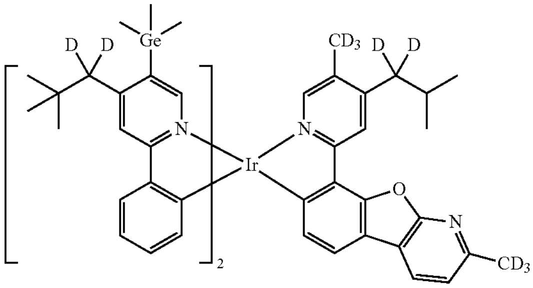
1317
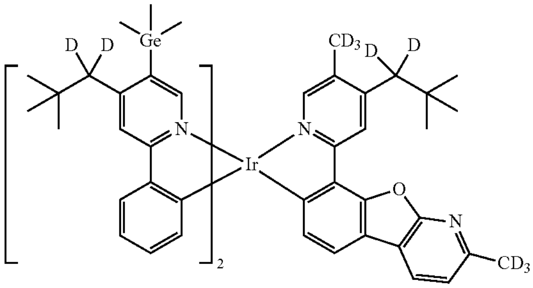
-continued
1318
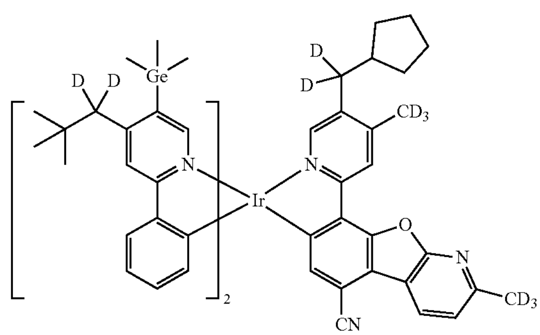
1319
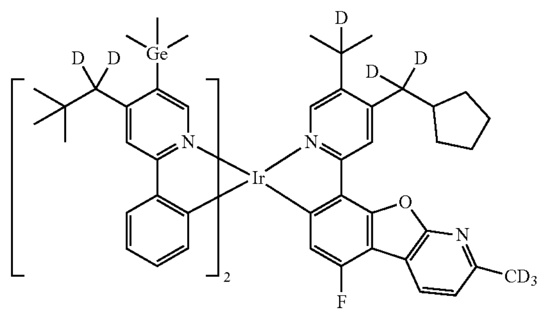
1320
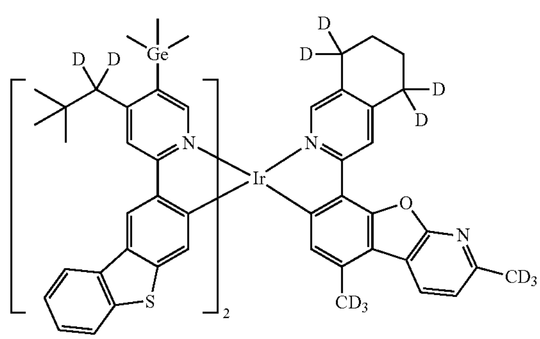
1321
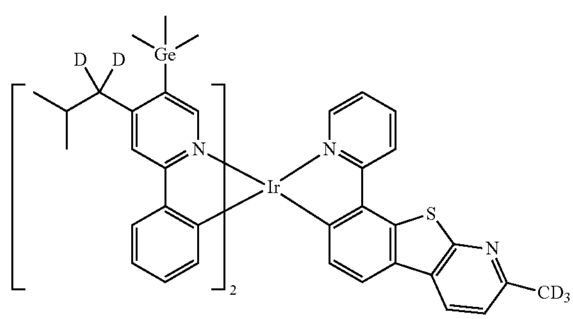

-continued
1322
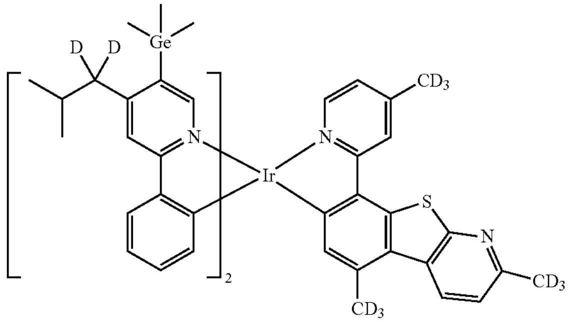
1323
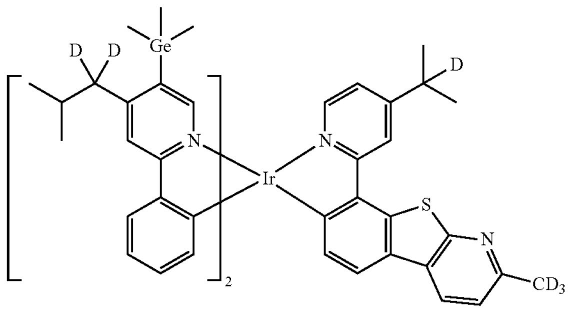
1324
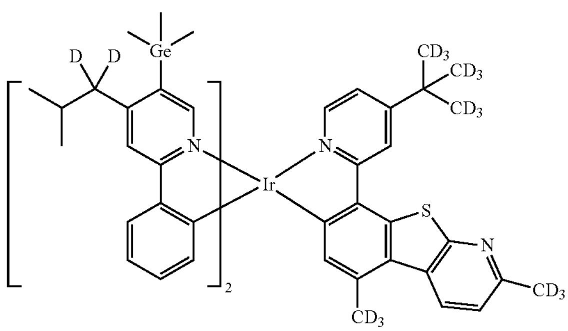
1325
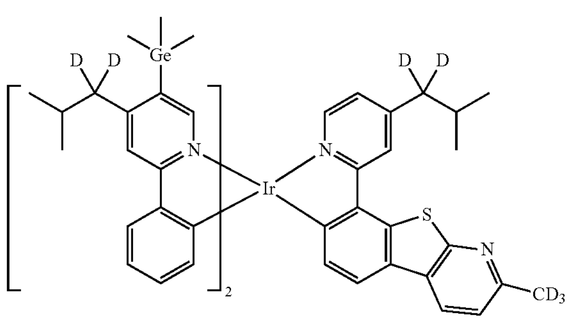
-continued
1326
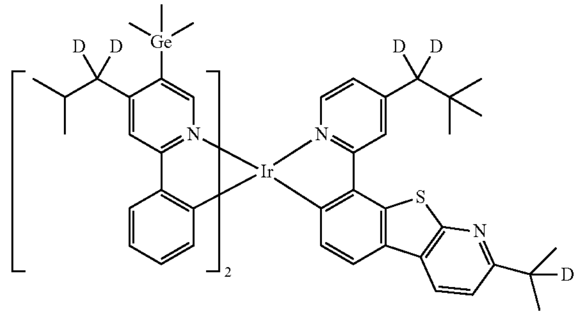
1327
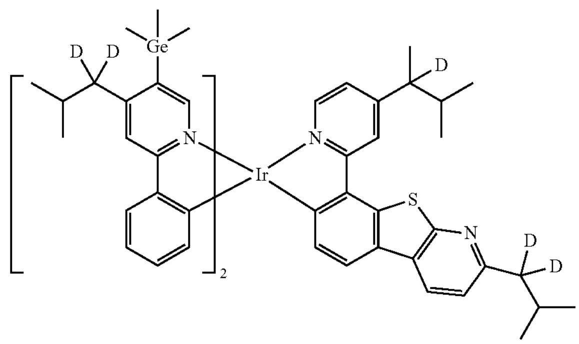
1328
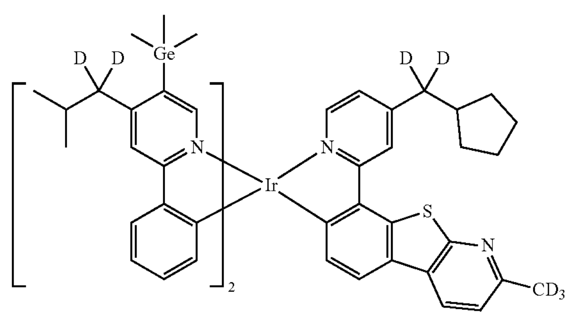
1329
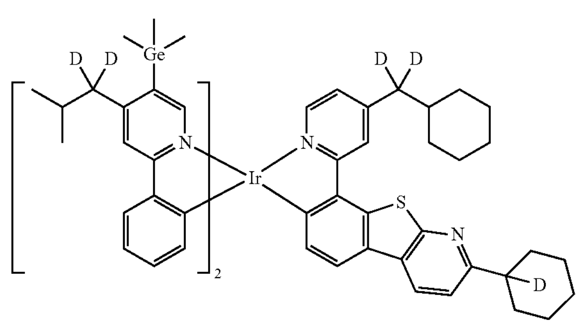

1330
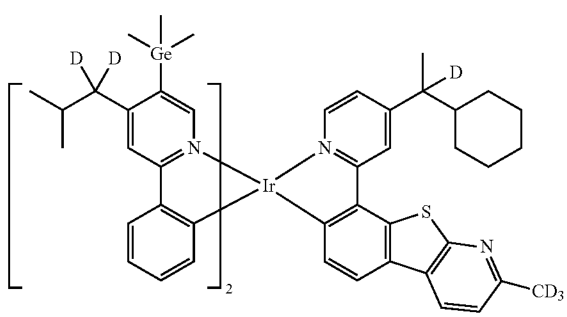
1331
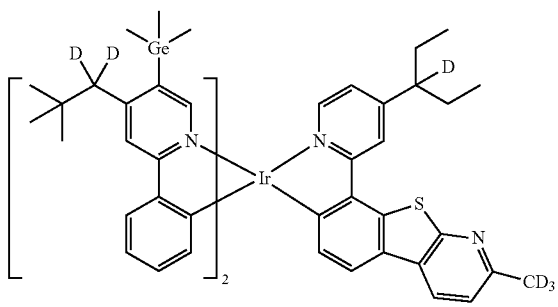
1332
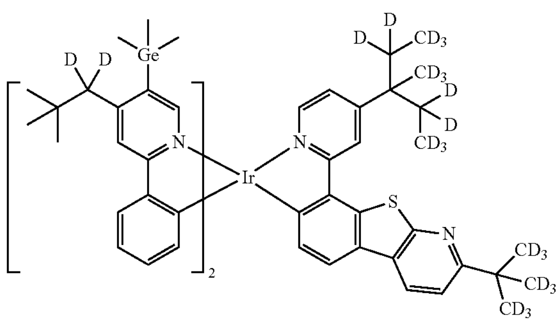
1333
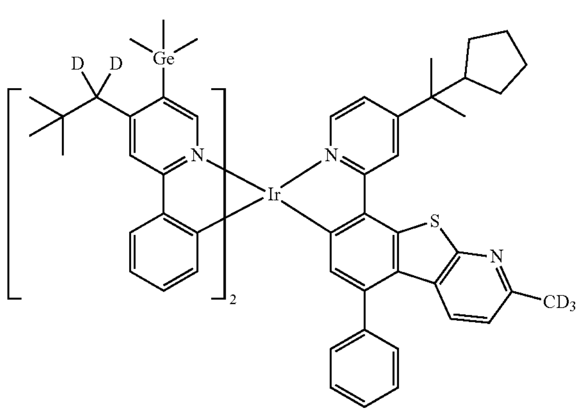
1334
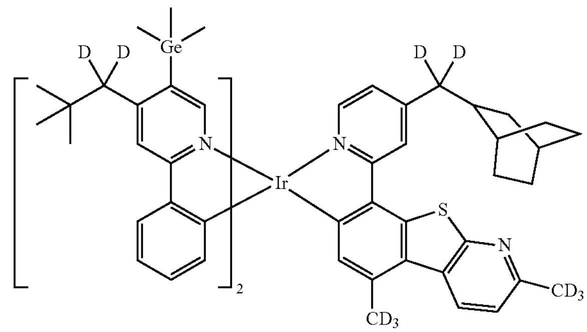
1335
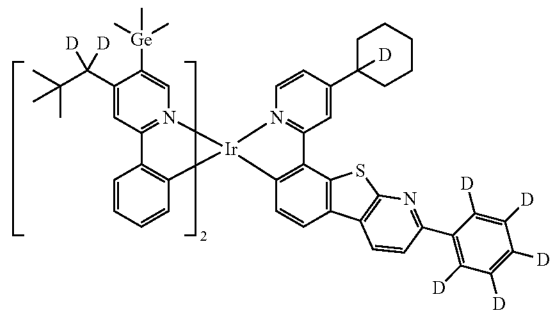
1336
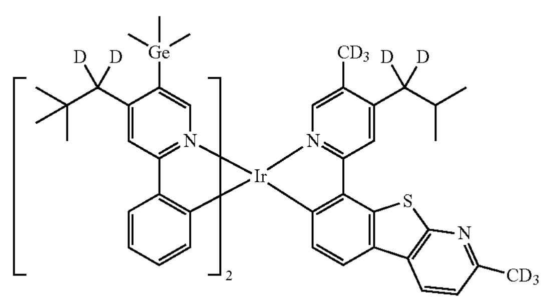
1337
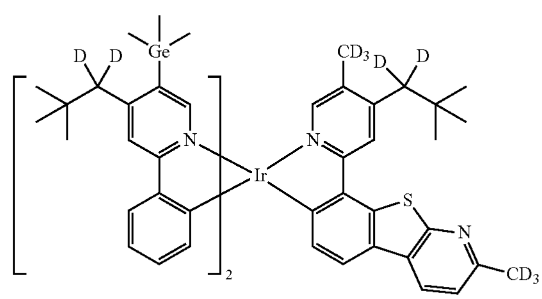

-continued
1338
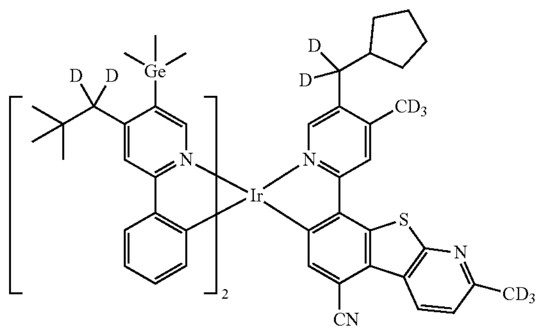
1339
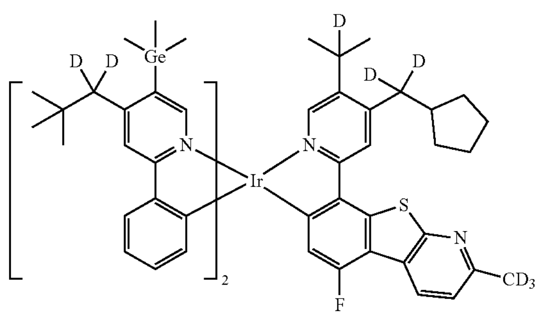
1340
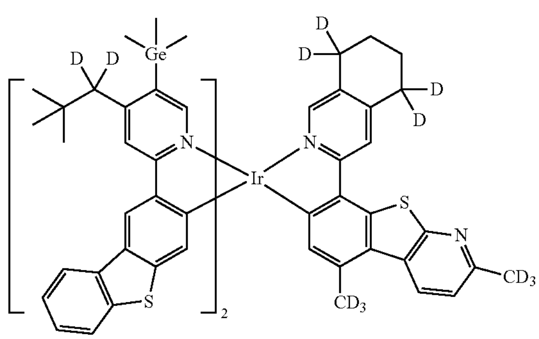
1341
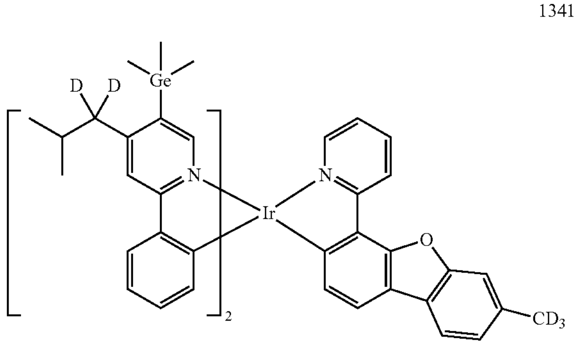
-continued
1342
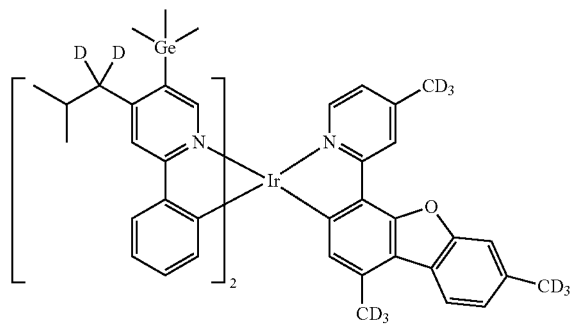
1343
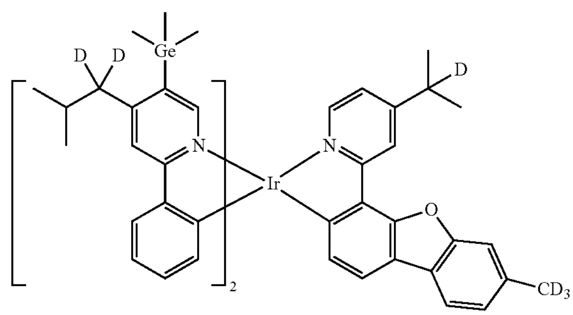
1344
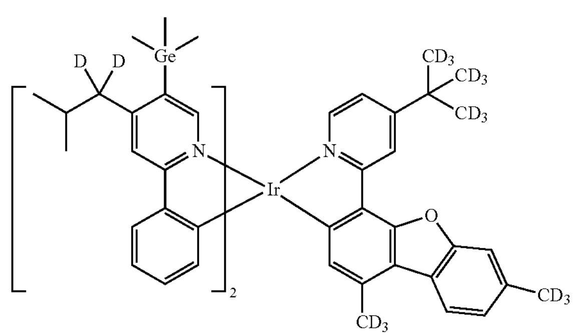
1345
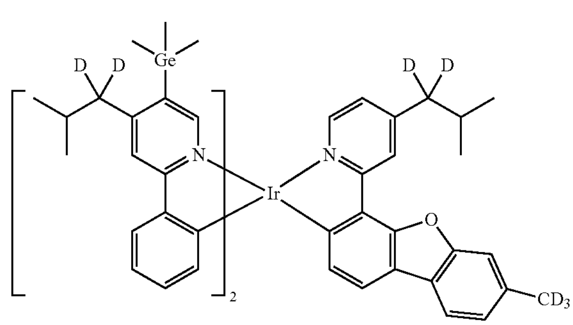

1346
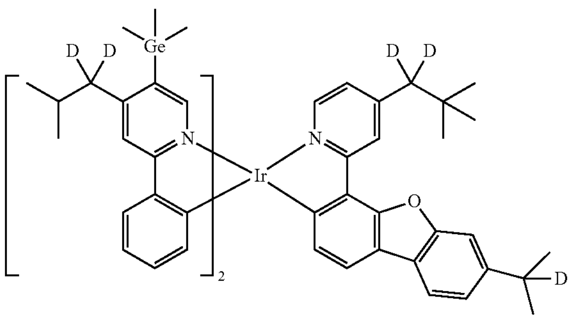
1347
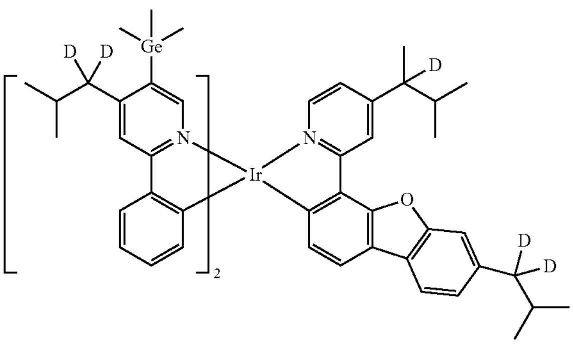
1348
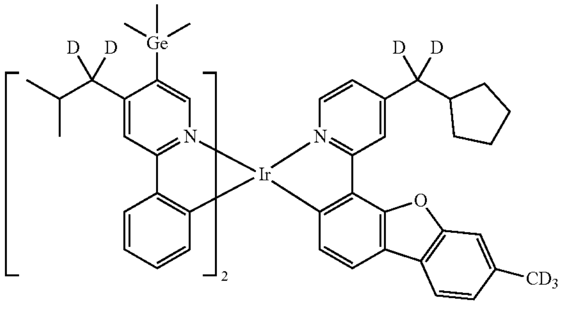
1349
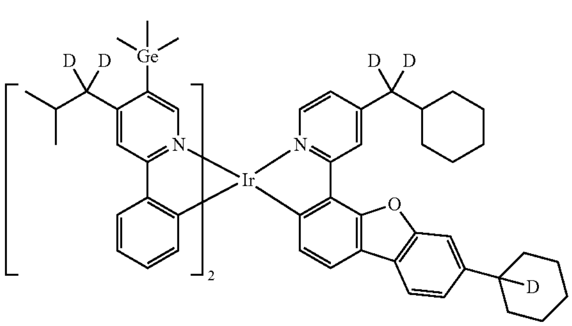
1350
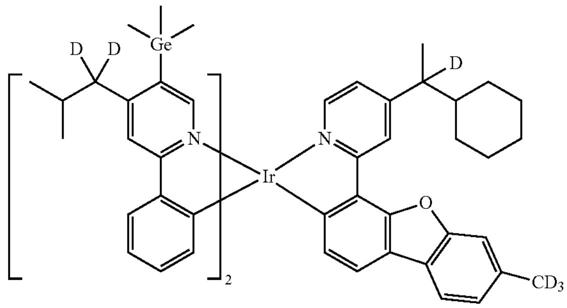
1351
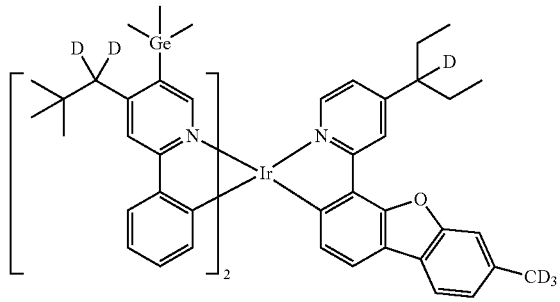
1352
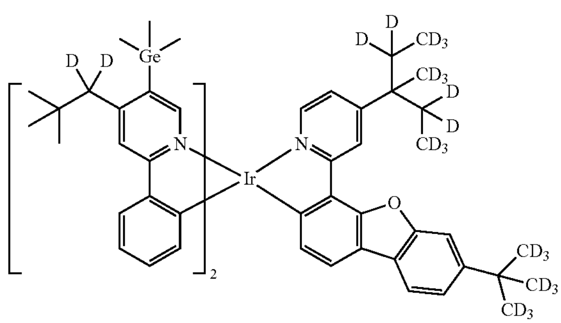
1353
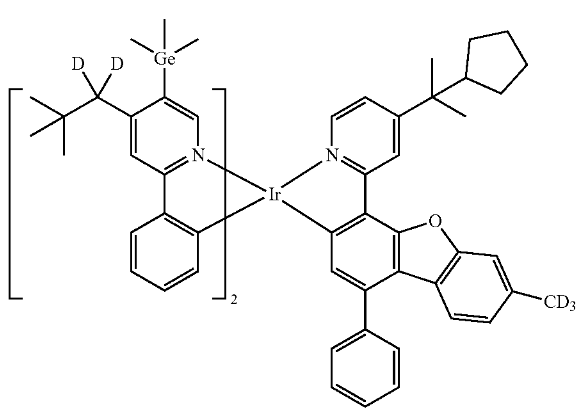

-continued
1354
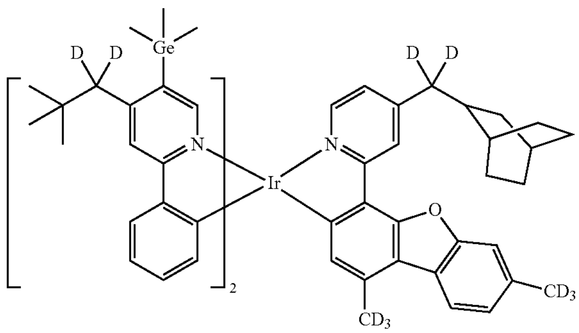
1355
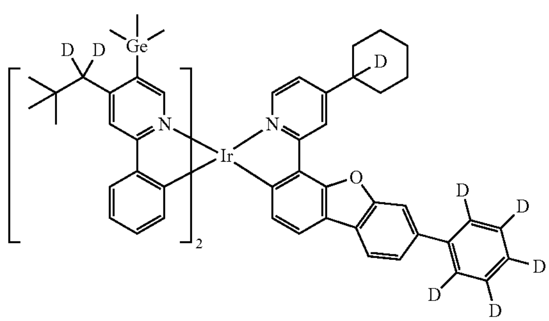
1356
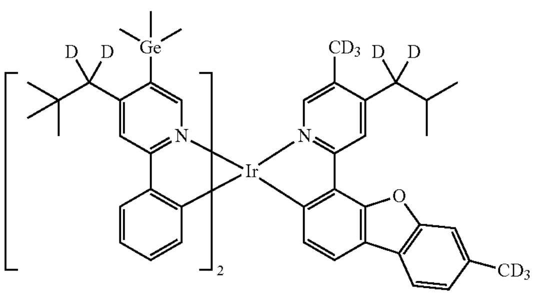
1357
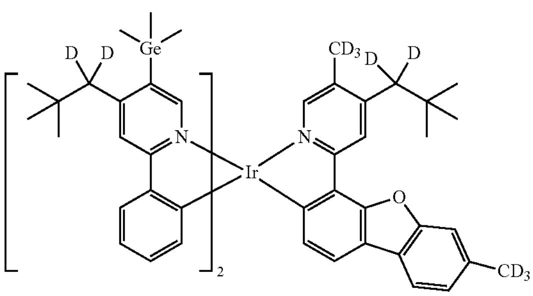
-continued
1358
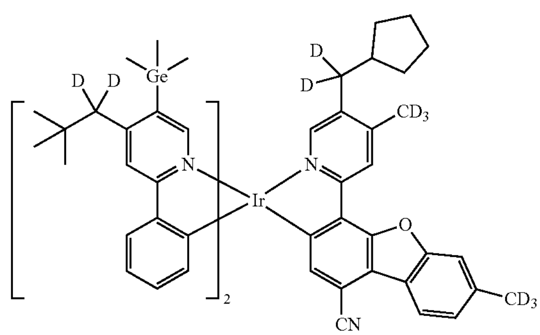
1359
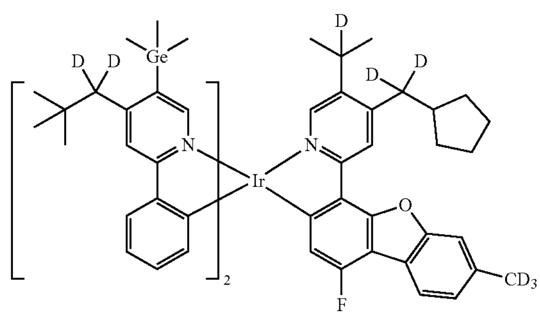
1360
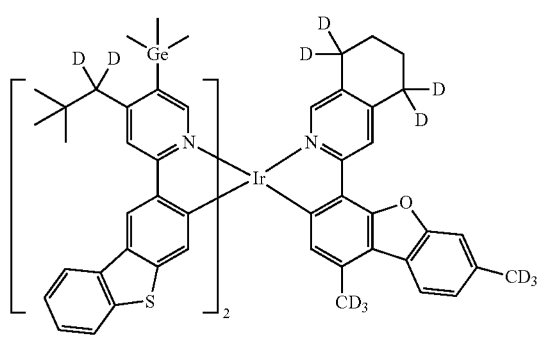
1361
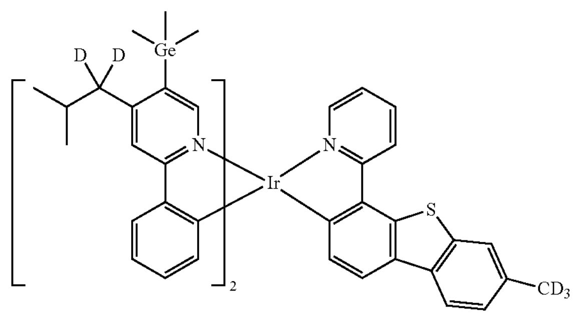

1362
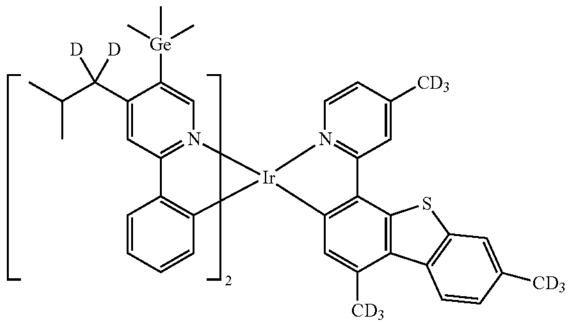
1363
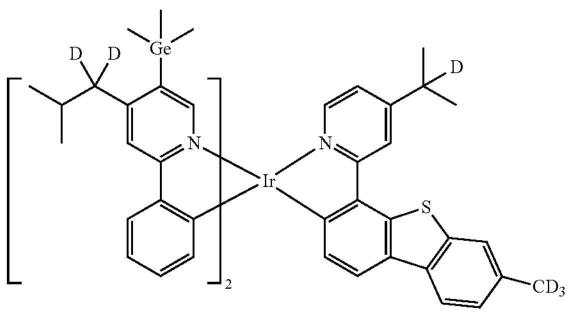
1364
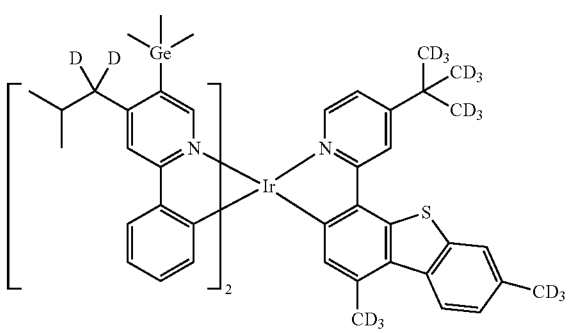
1365
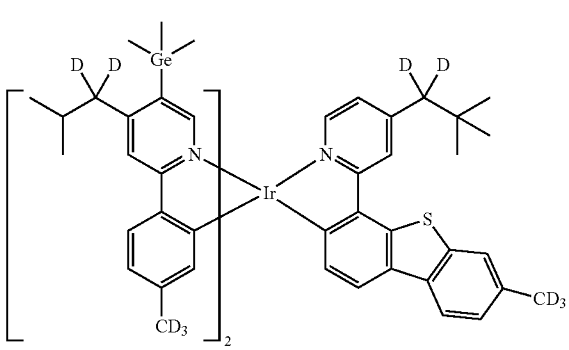
1366
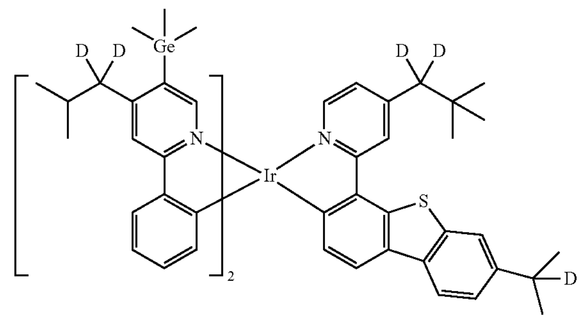
1367
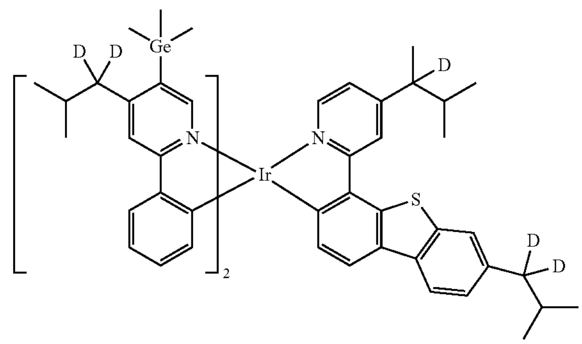
1368
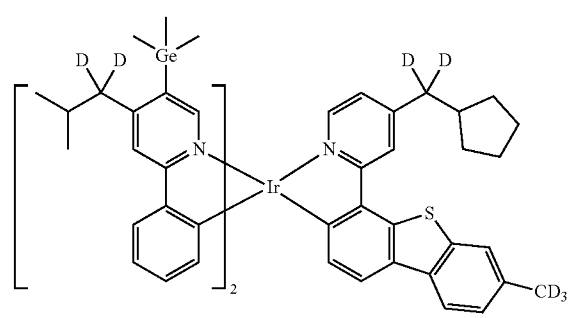
1369
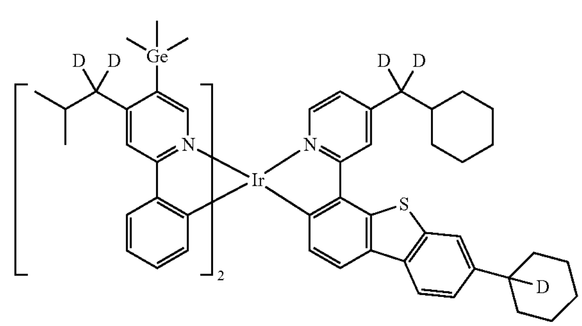

-continued
-continued
1370
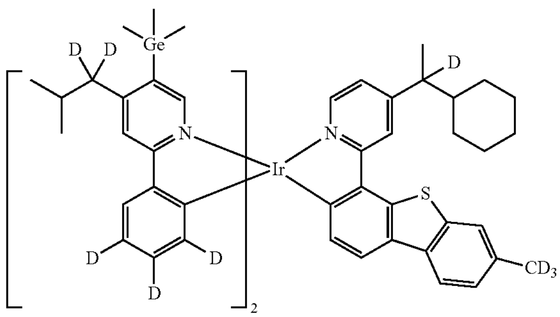
1371
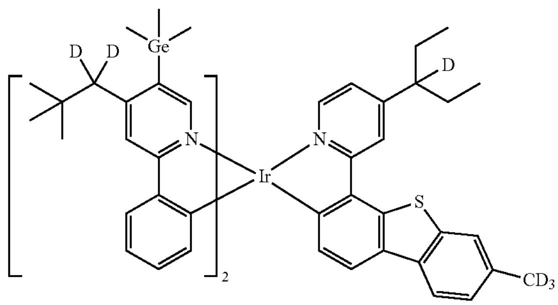
1372
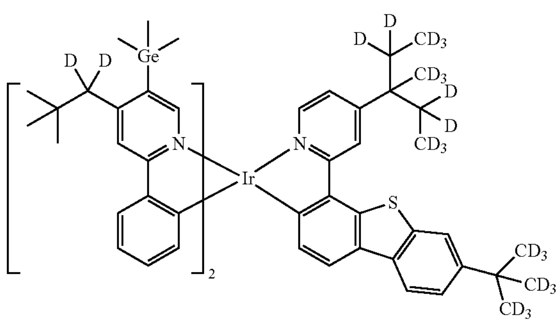
1373
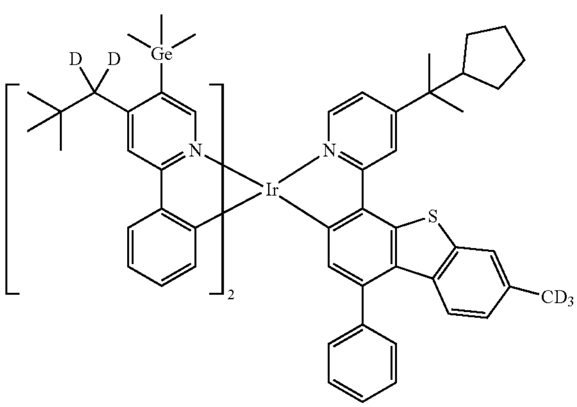
1374
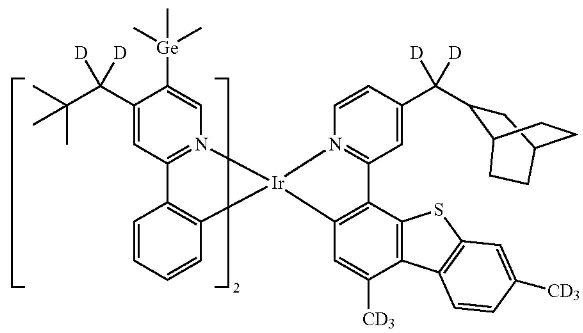
1375
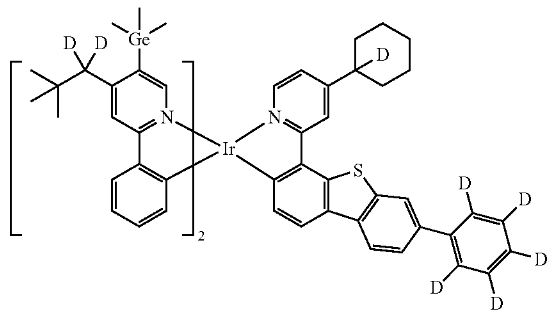
1376
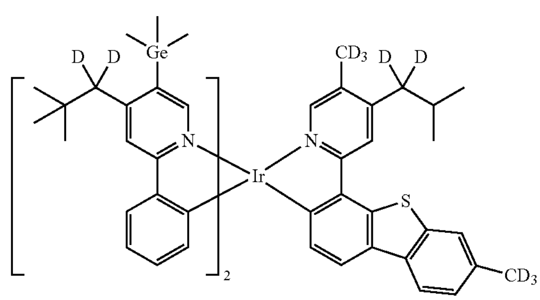
1377
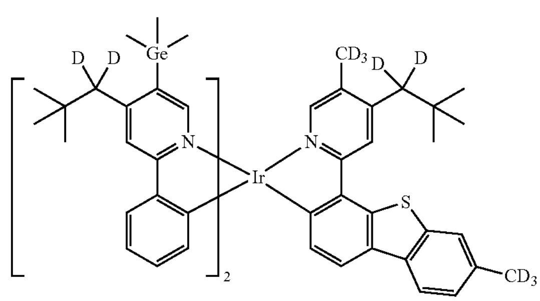

-continued
1378
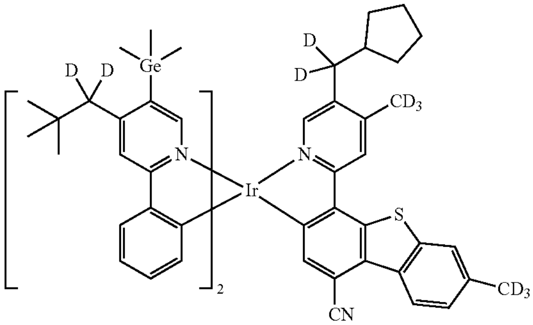
1379
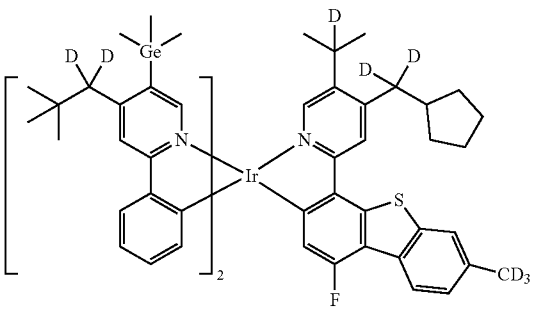
1380
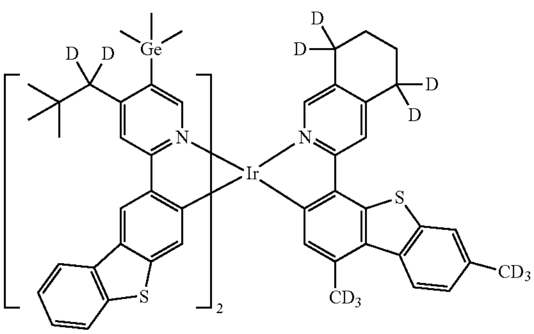
1381
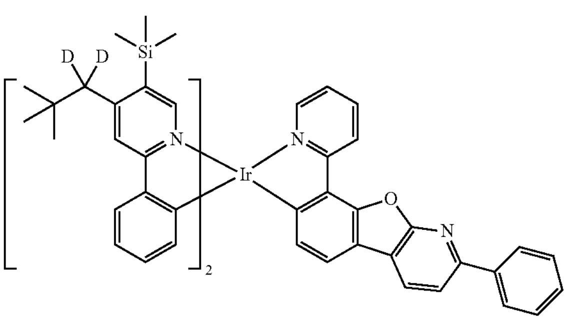
-continued
1382
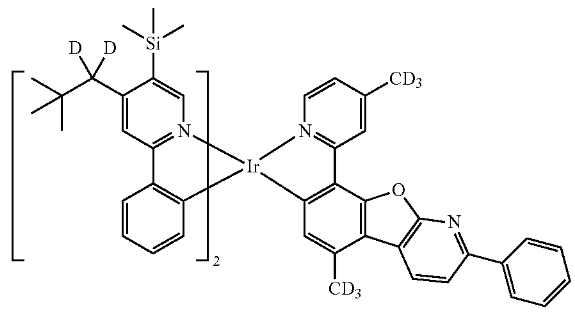
1383
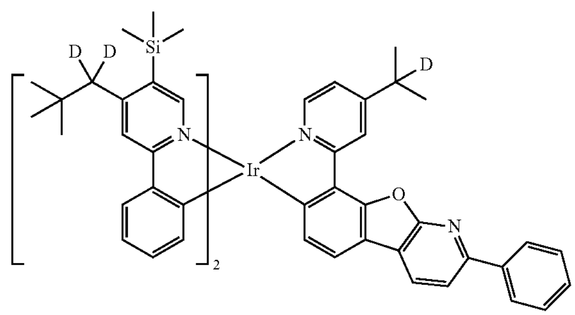
1384
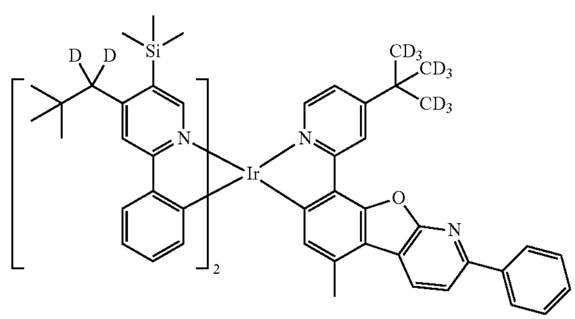
1385
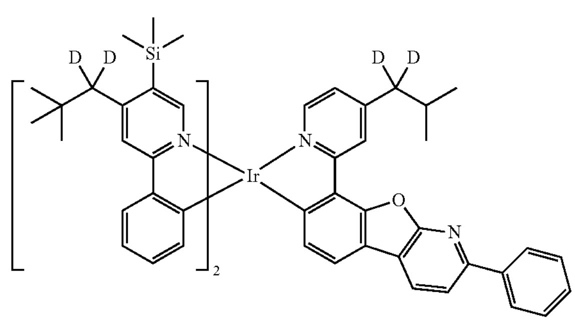

1386
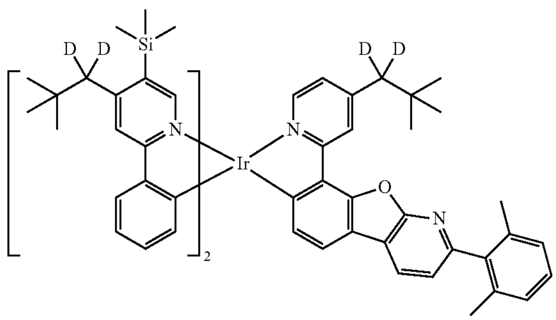
1387
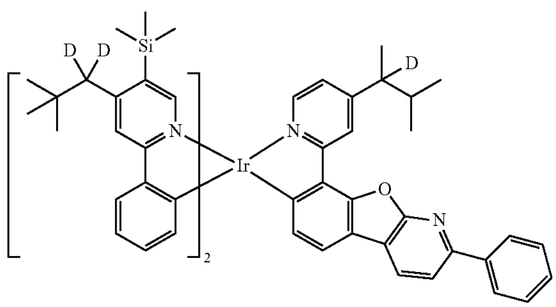
1388
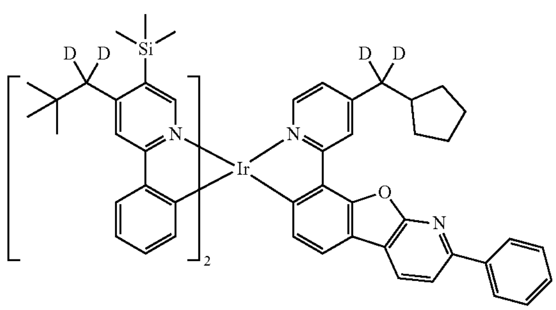
1389
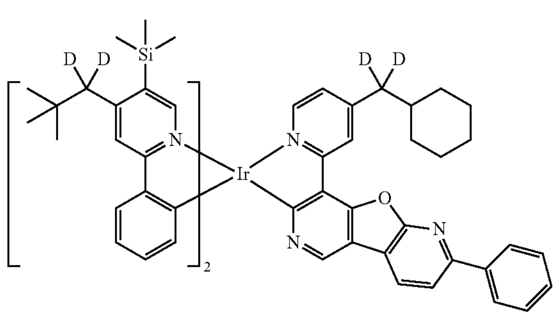
1390
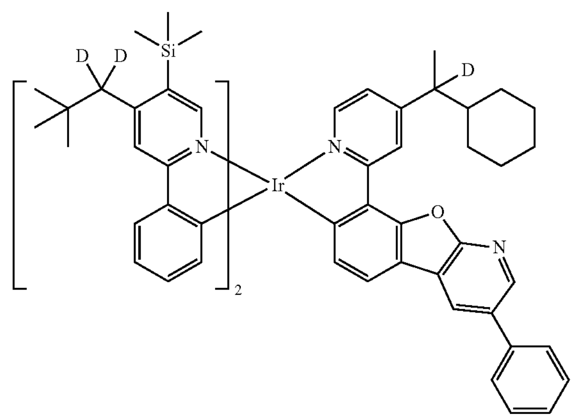
1391
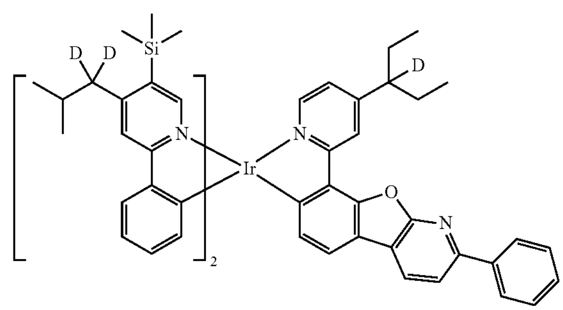
1392
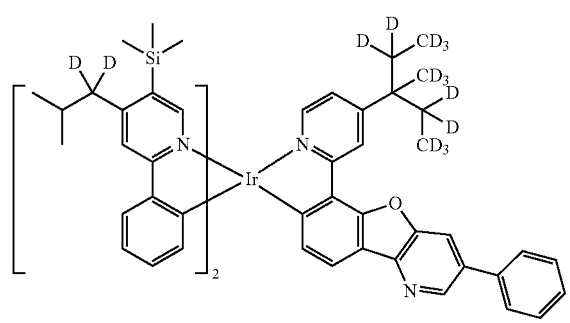
1393
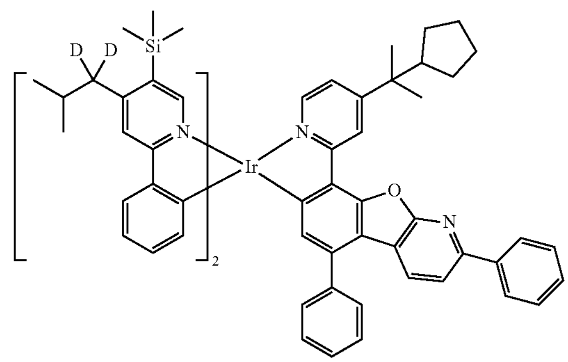

-continued
1394
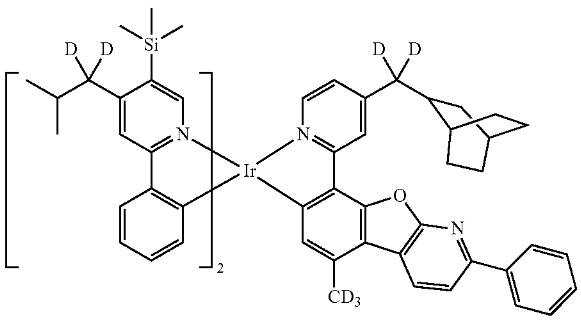
1395
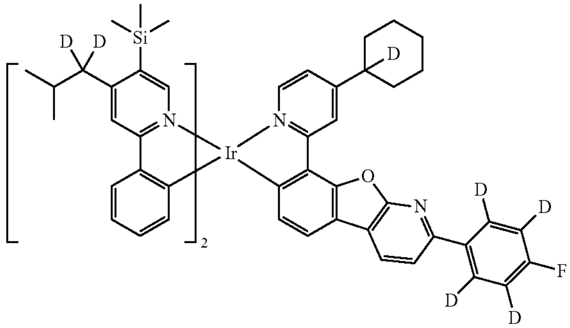
1396
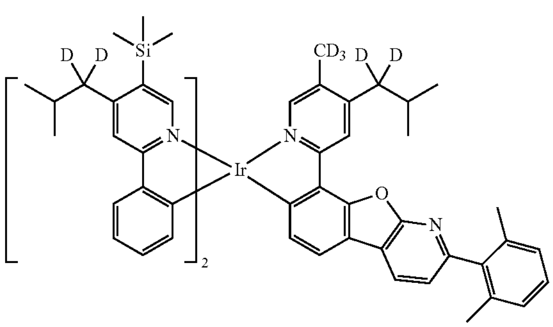
1397
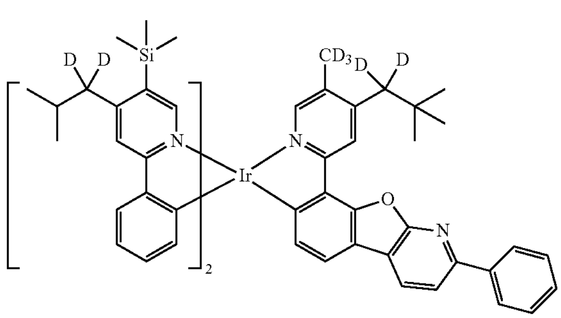
-continued
1398
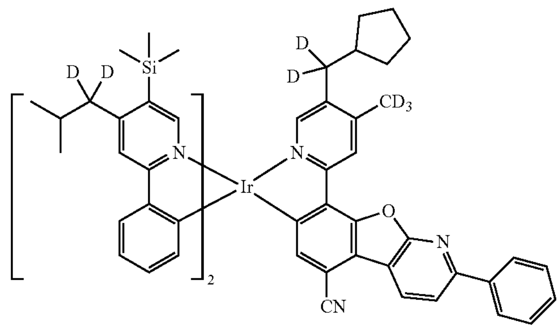
1399
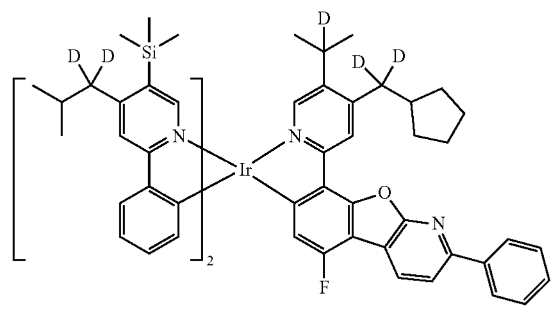
1400
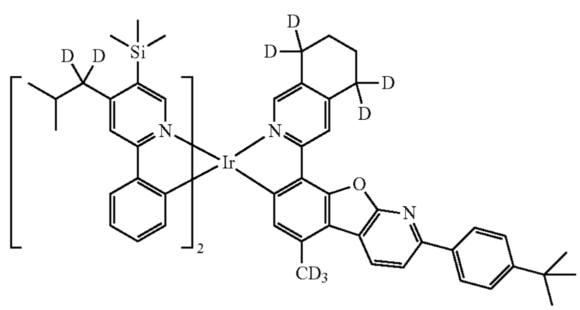
1401
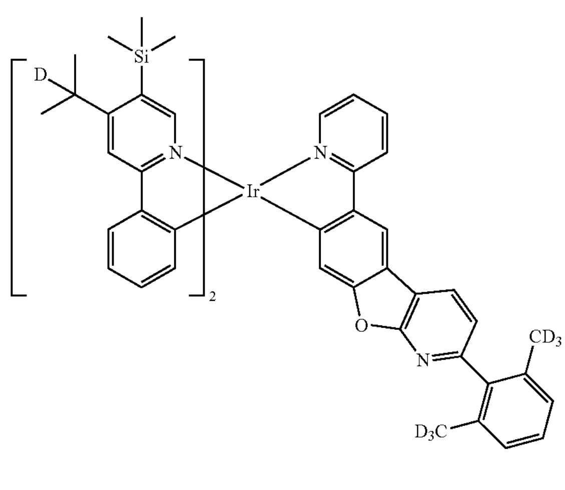

-continued
1402
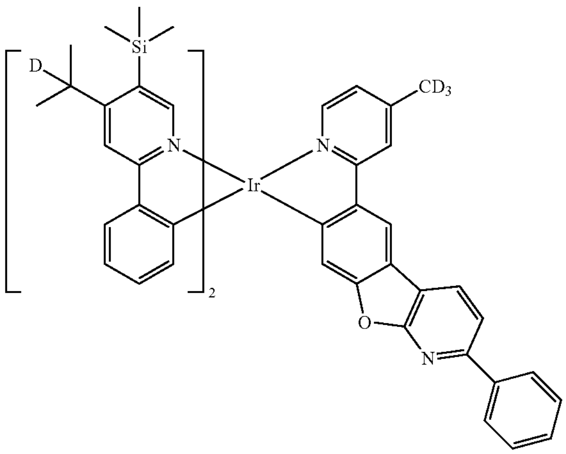
1405
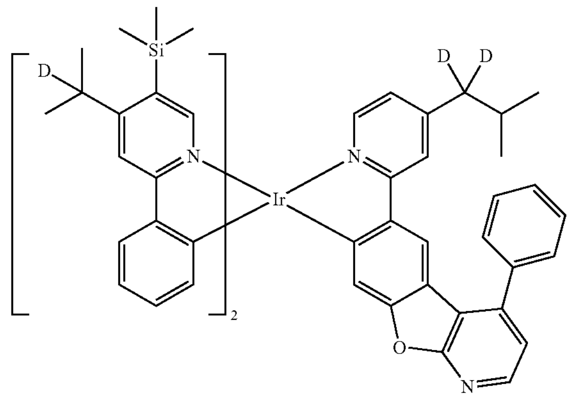
1403
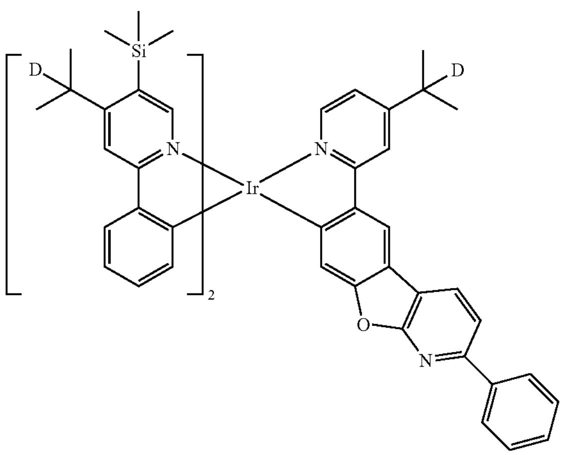
1406
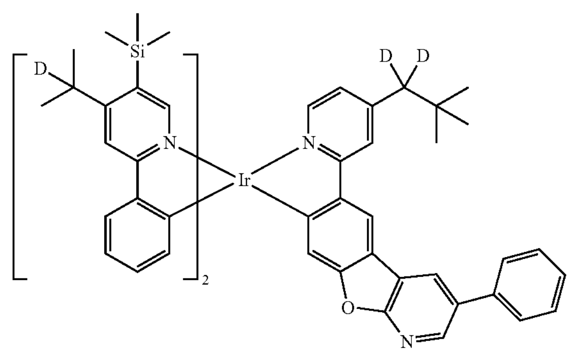
1404
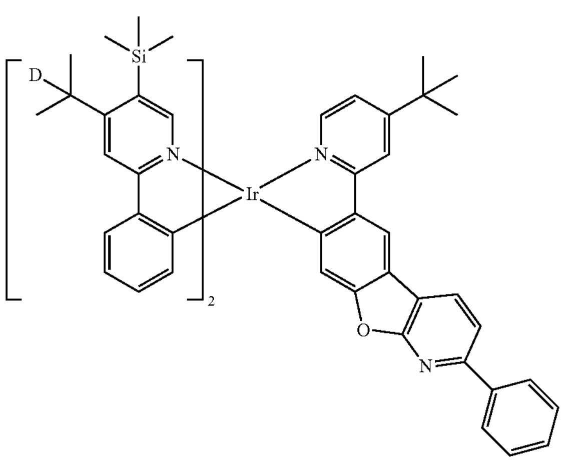
1407
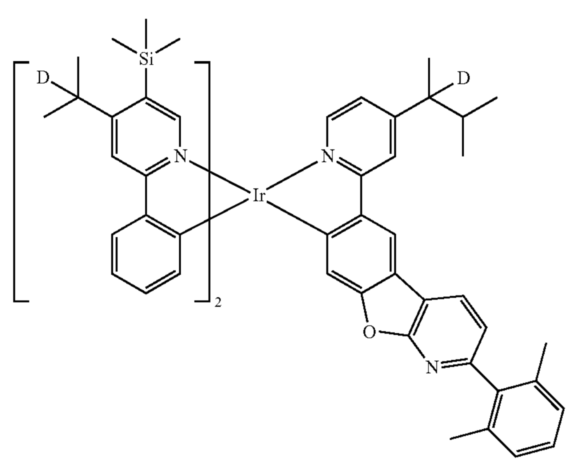

-continued
1408
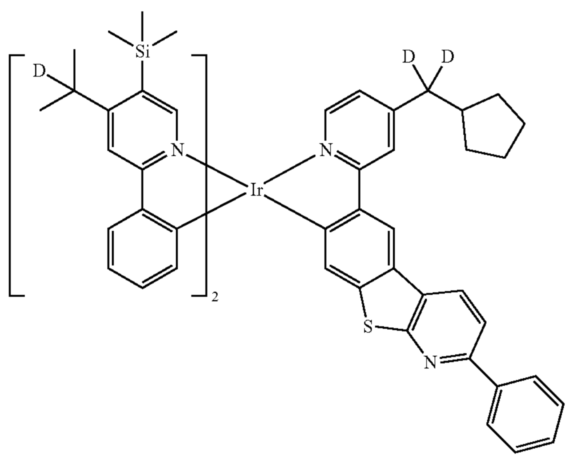
1409
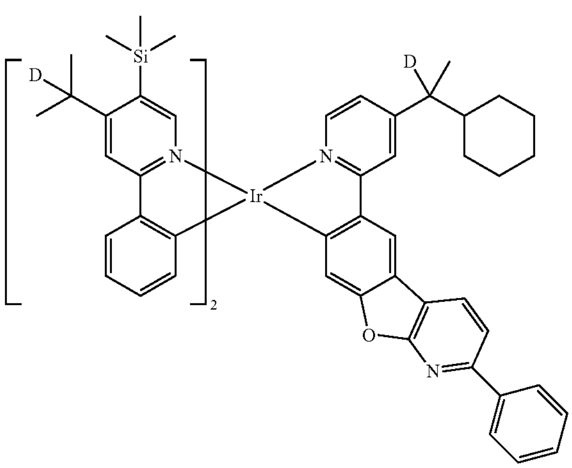
1410
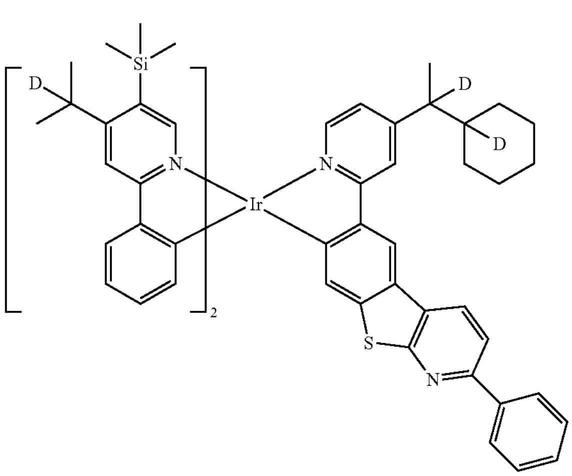
-continued
1411
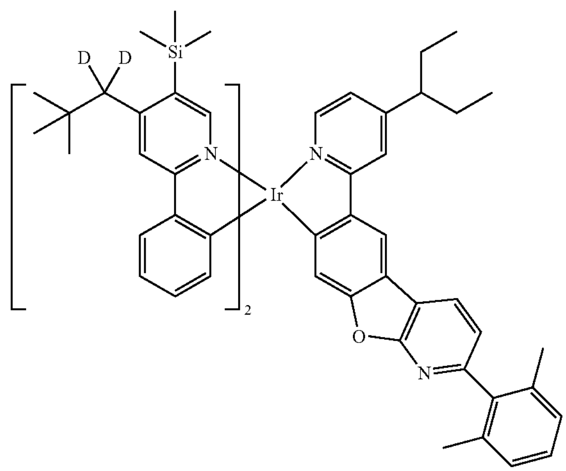
1412
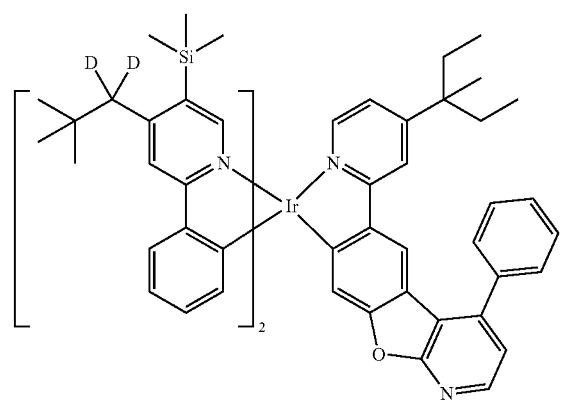
1413
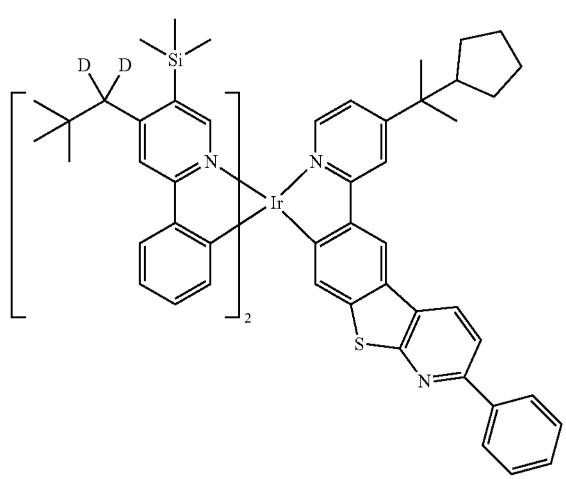

1414
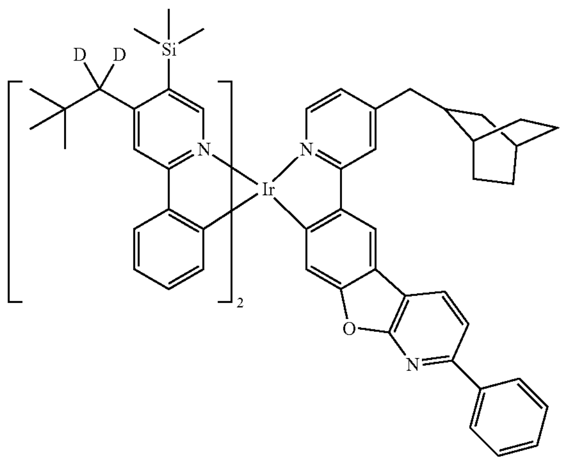
1415
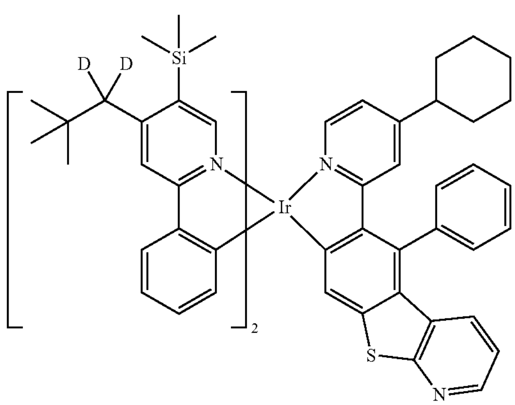
1416
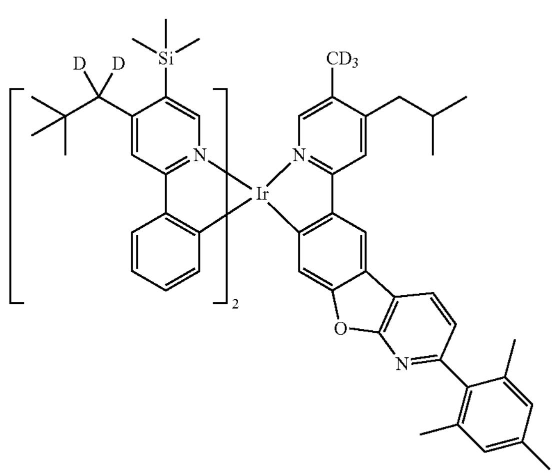
1417
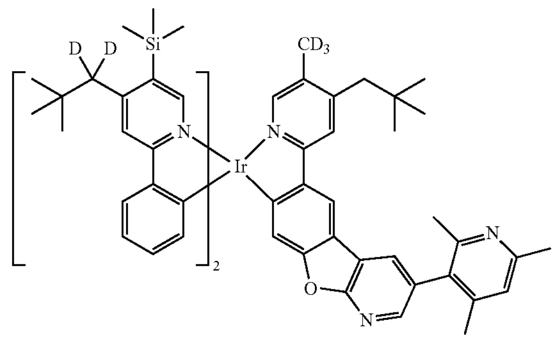
1418
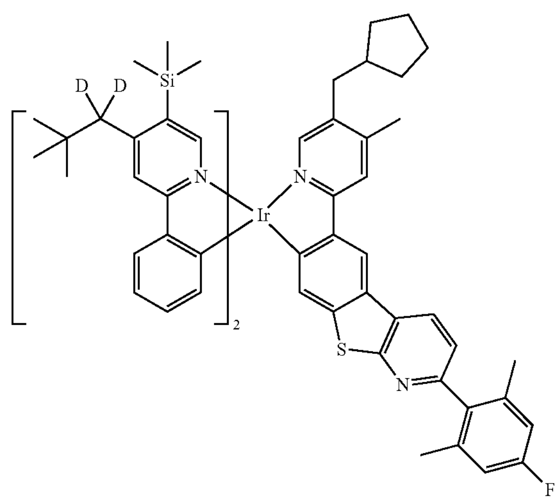
1419
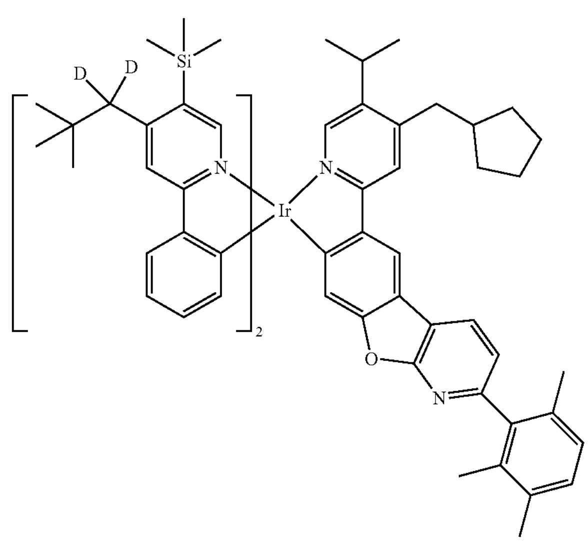

-continued
1420
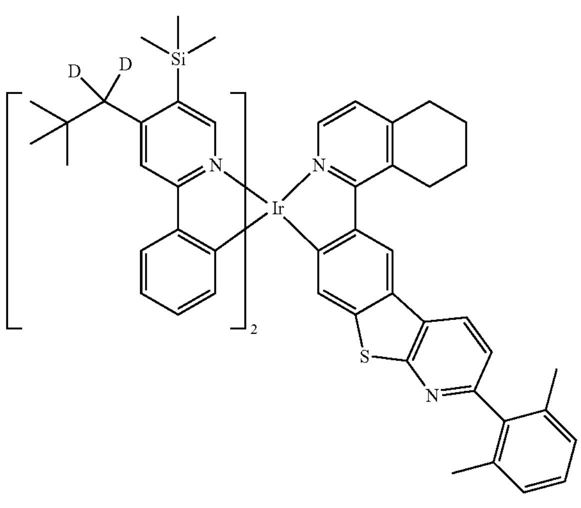
1421
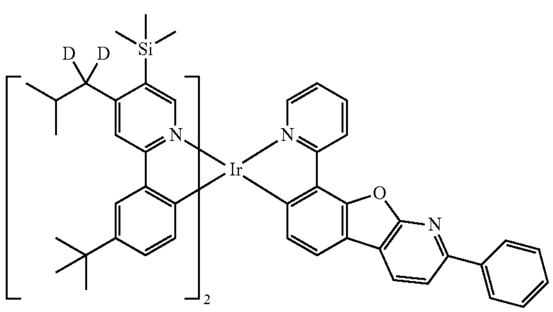
1422
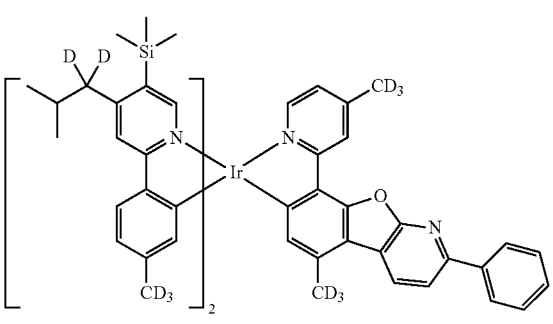
1423
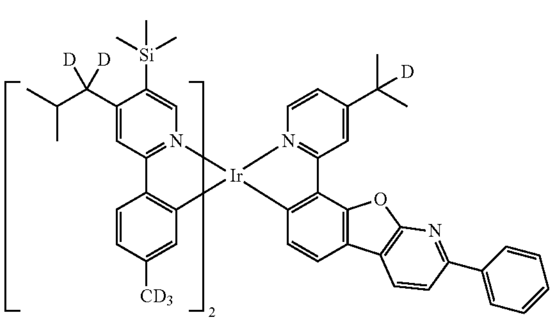
-continued
1424
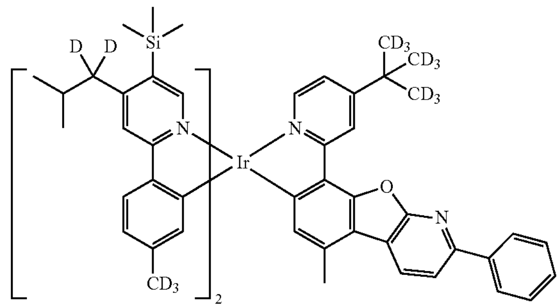
1425
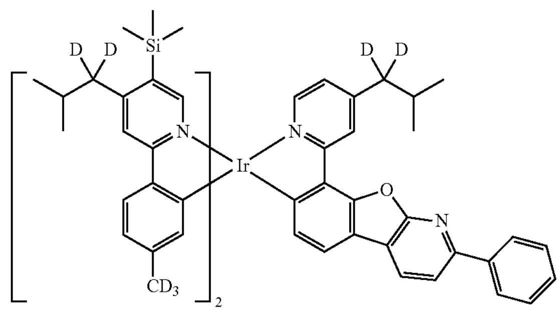
1426
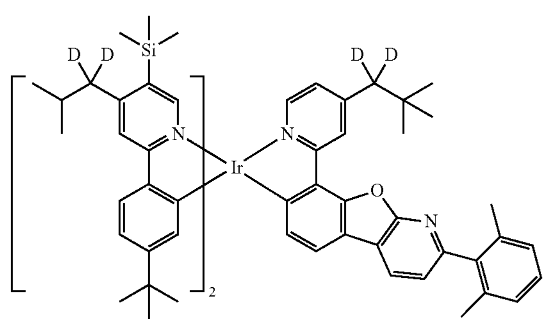
1427
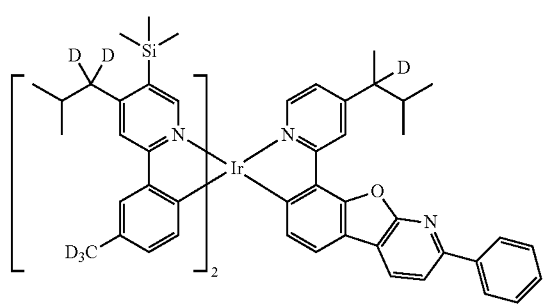
1428
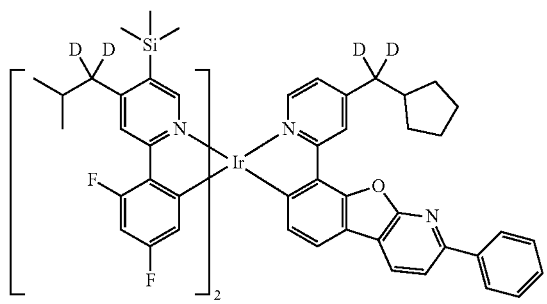

-continued
1429
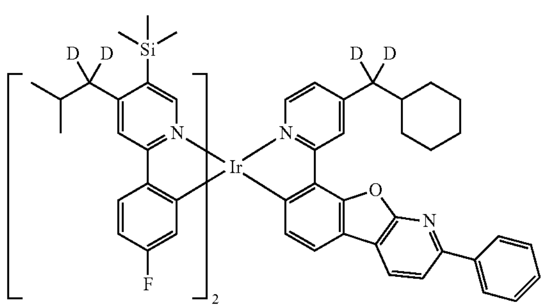
1430
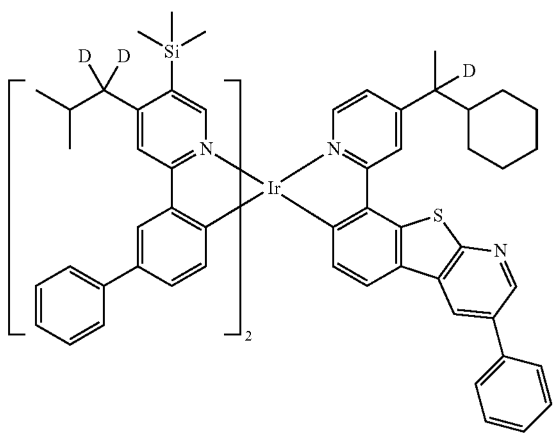
1431
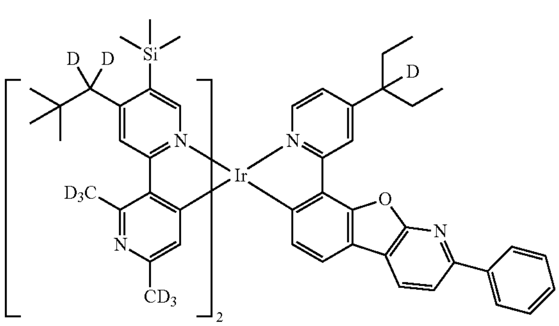
1432
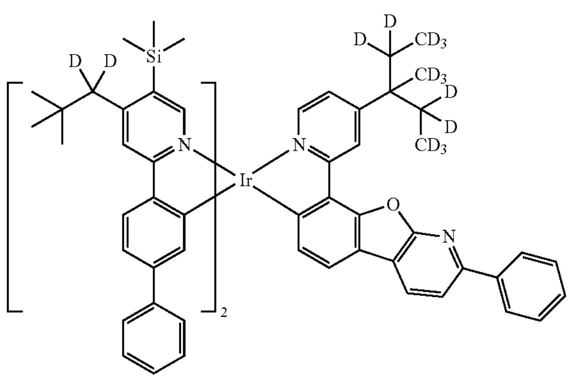
-continued
1433
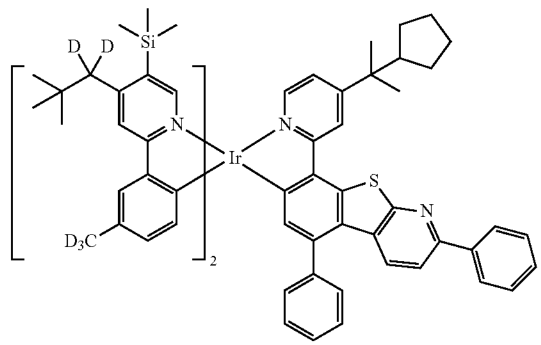
1434
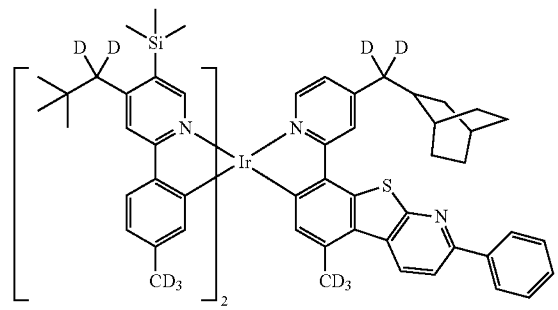
1435
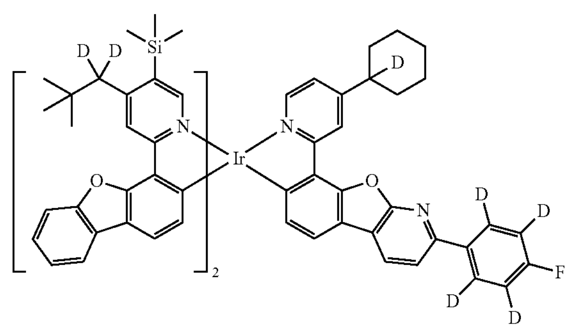
1436
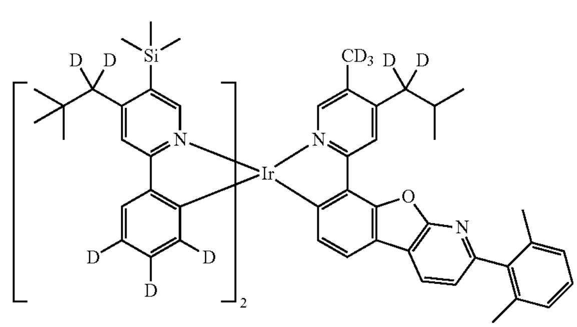

-continued
1437
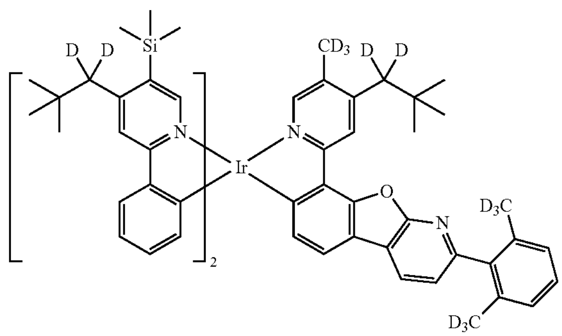
1438
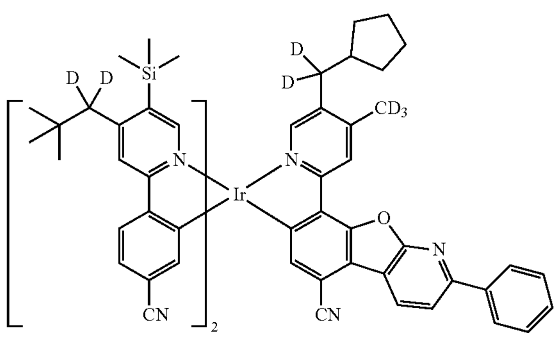
1439
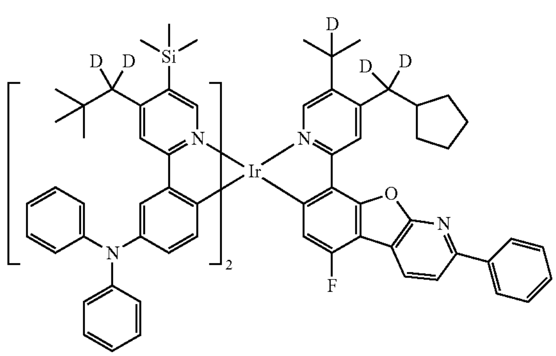
1440
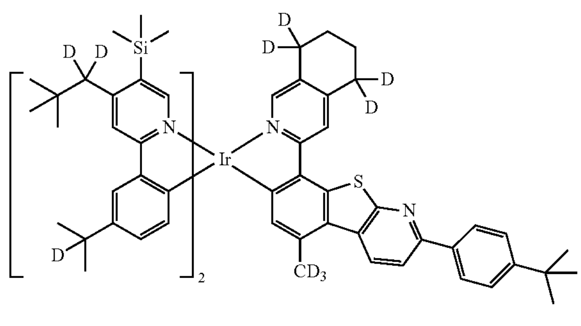
1441
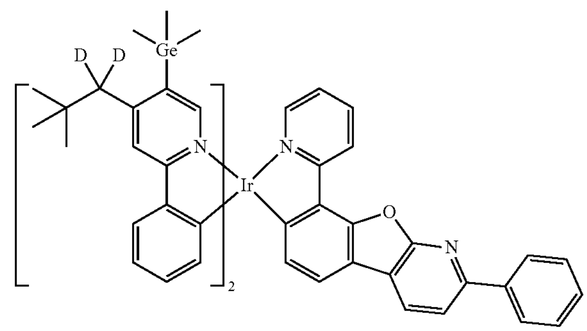
1442
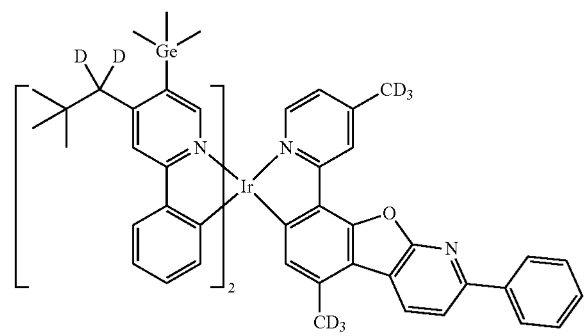
1443
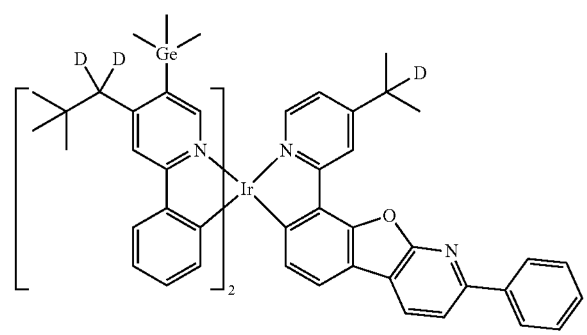
1444
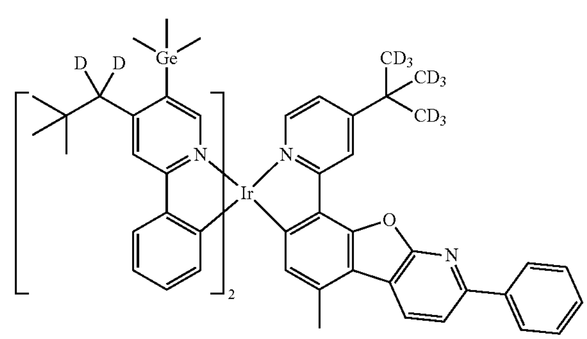

1445
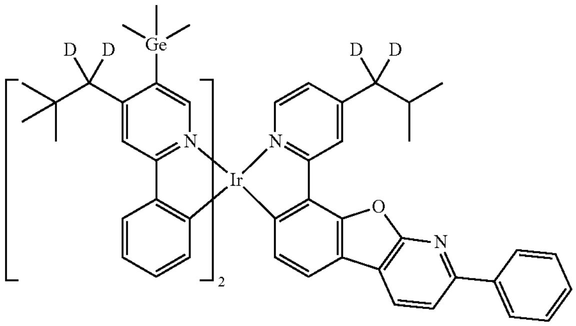
1446
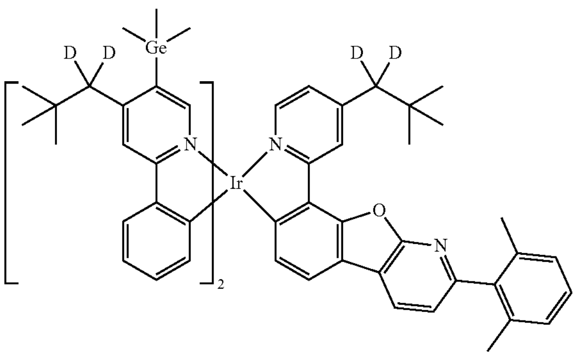
1447
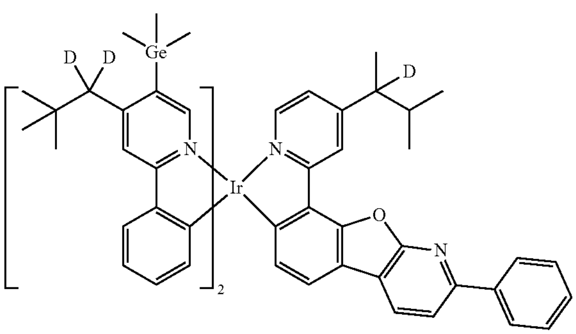
1448
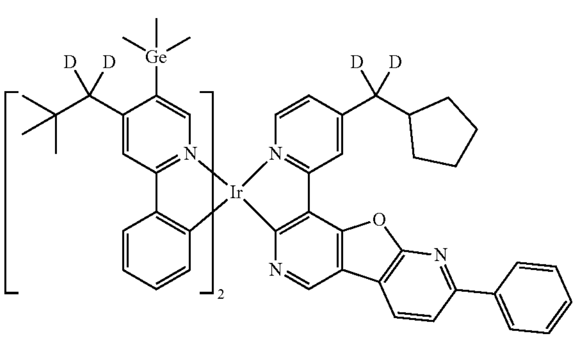
1449
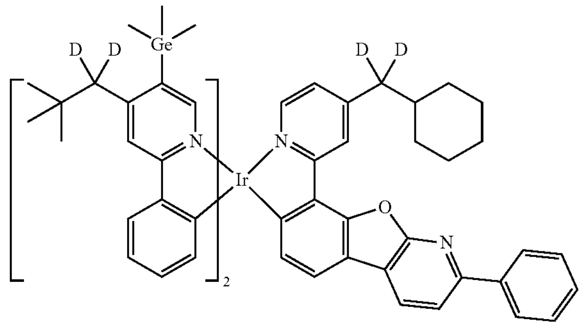
1450
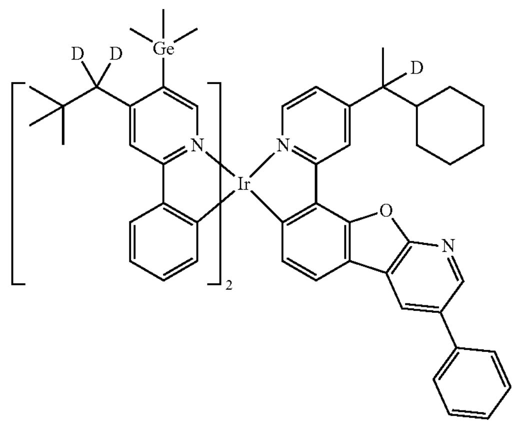
1451
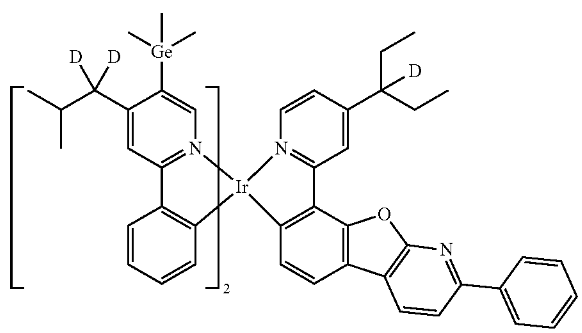
1452
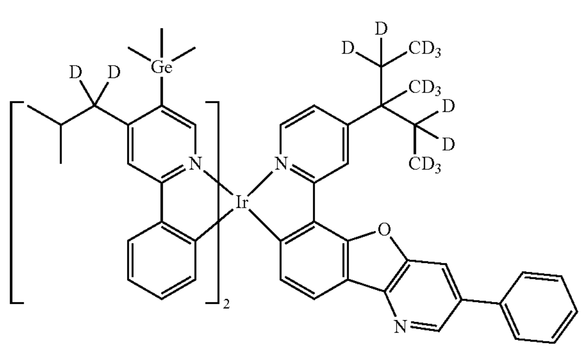

1453
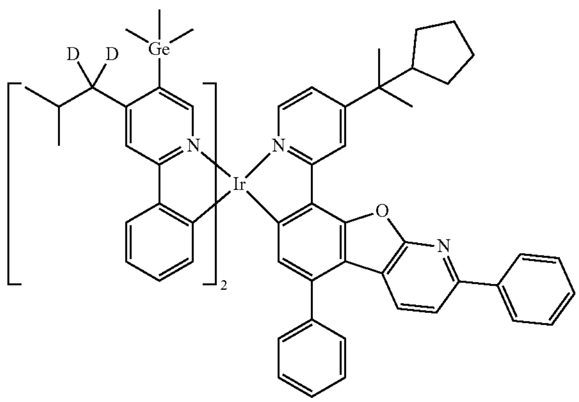
1454
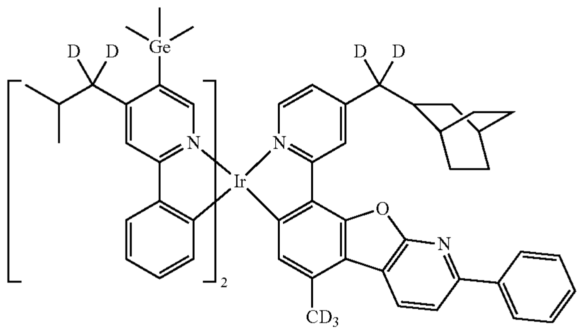
1455
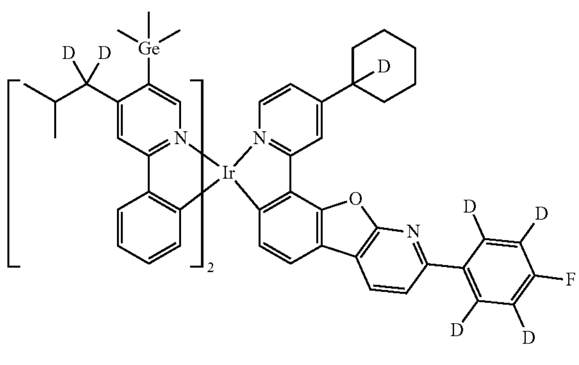
1456
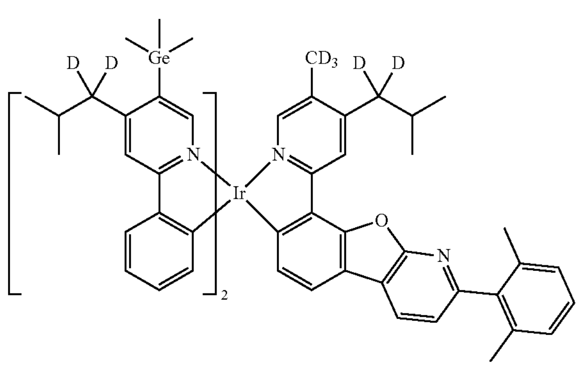
1457
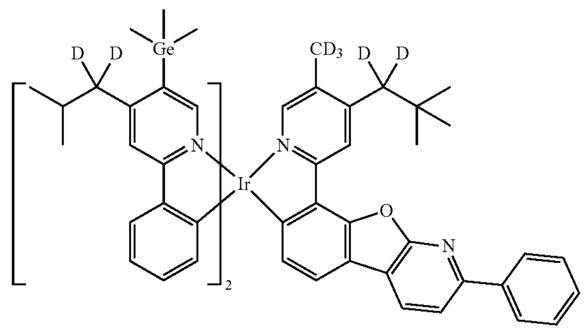
1458
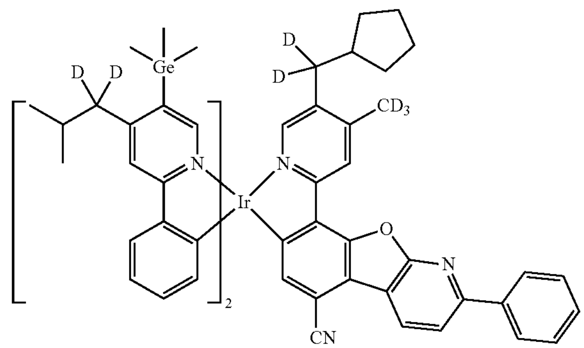
1459
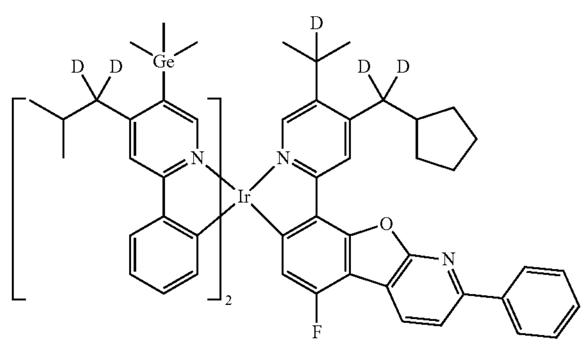
1460
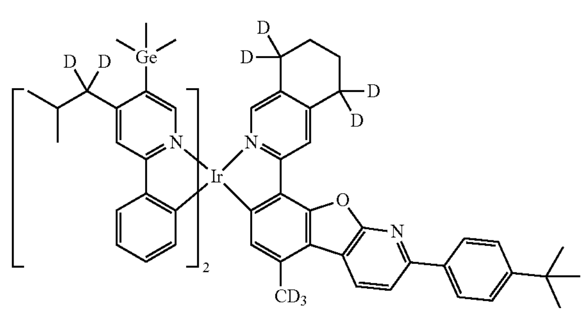

-continued
1461
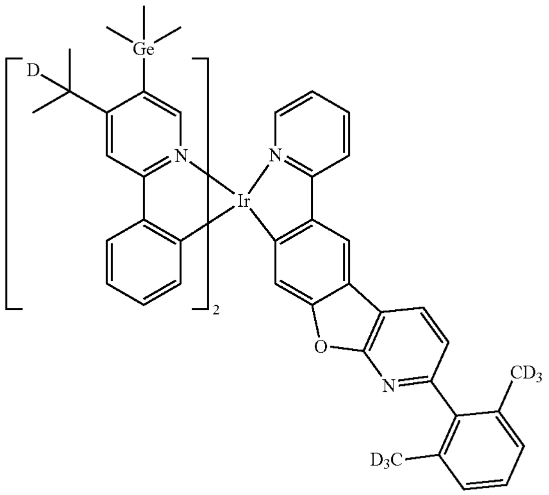
1462
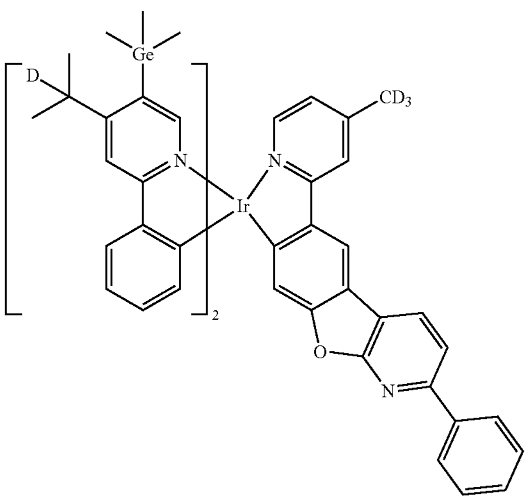
1463
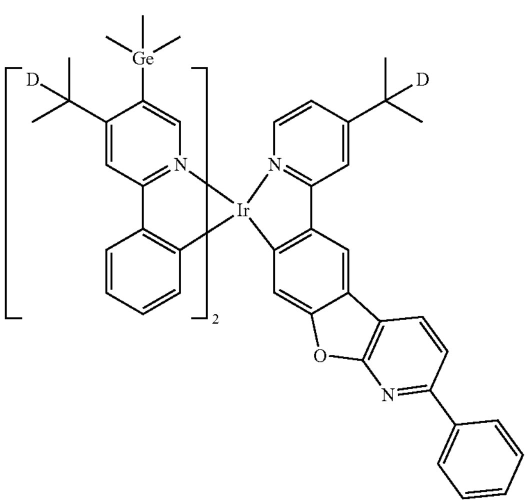
-continued
1464
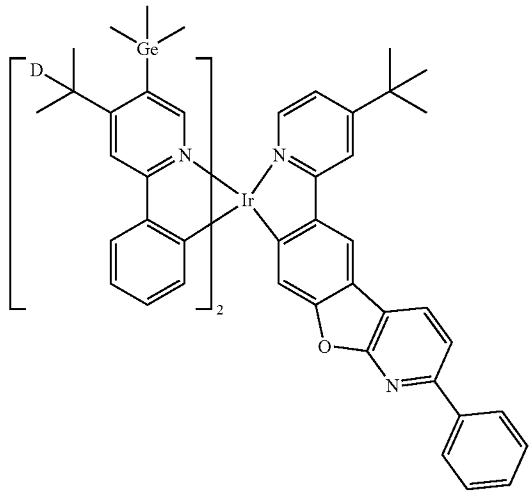
1465
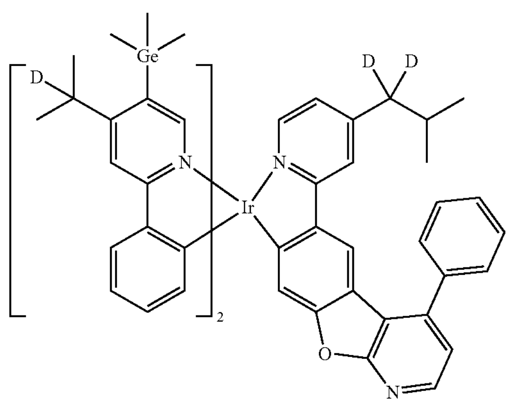
1466
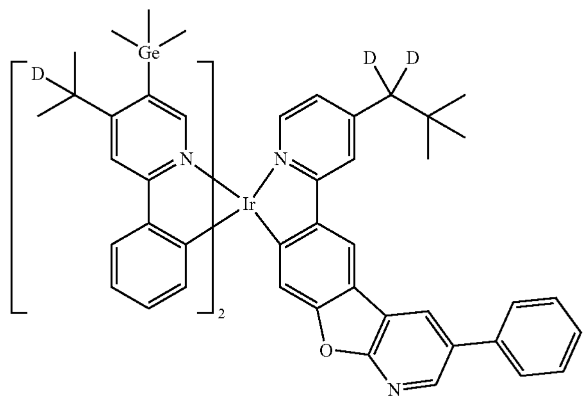

1467
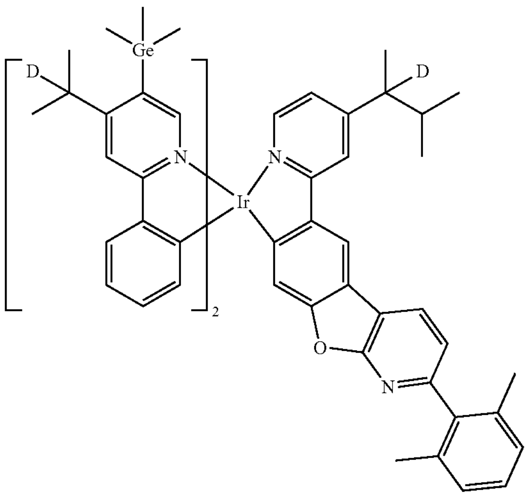
1468
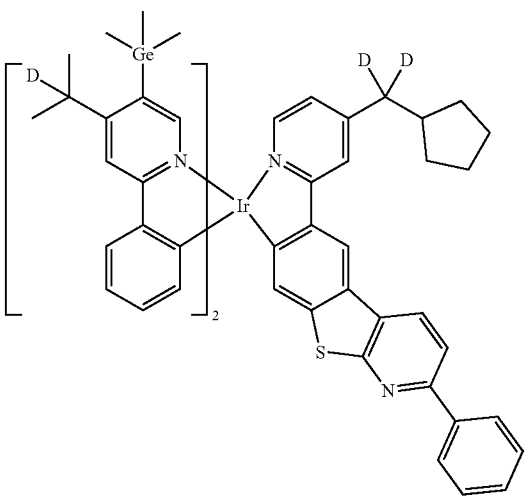
1469
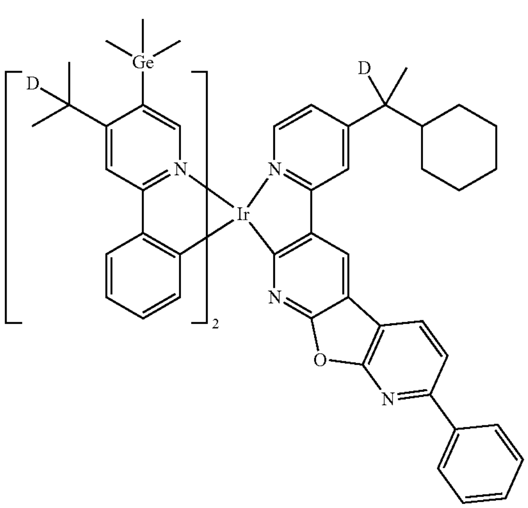
1470
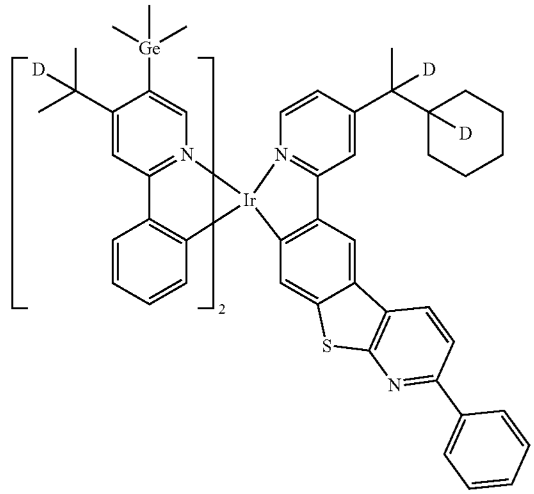
1471
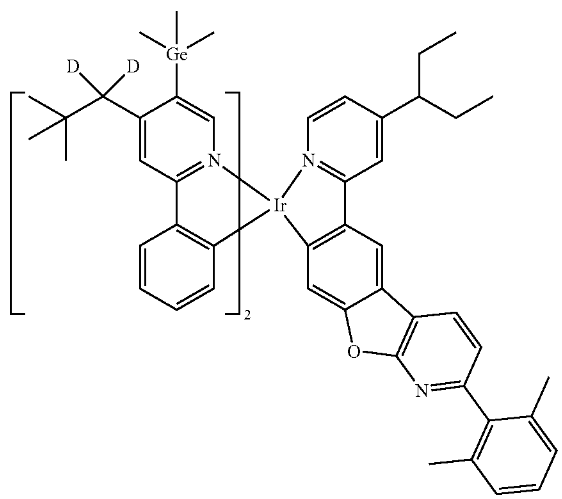
1472
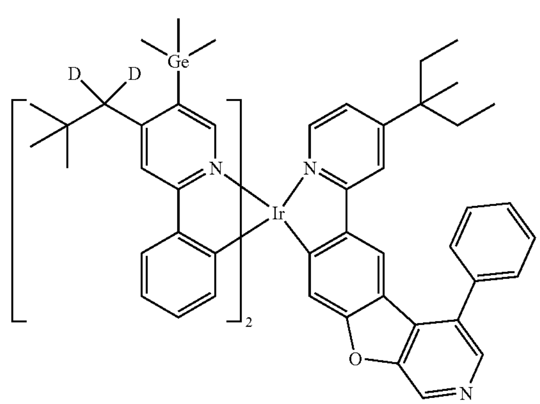

1473
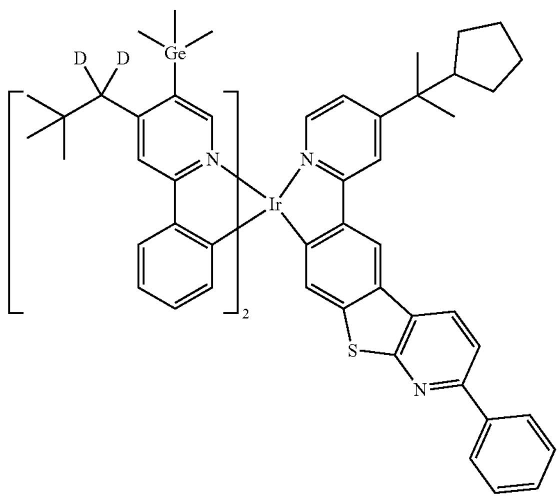
1474
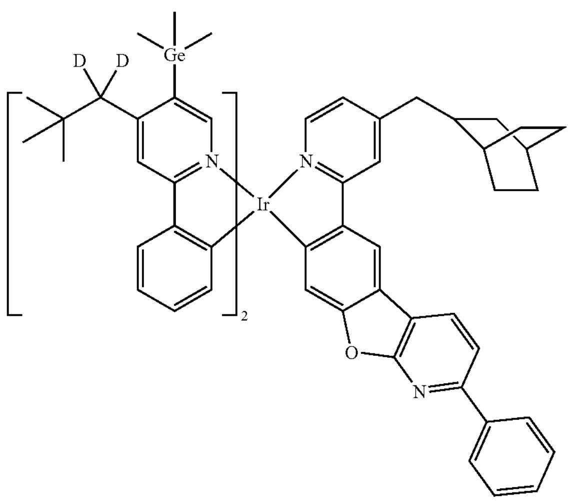
1475
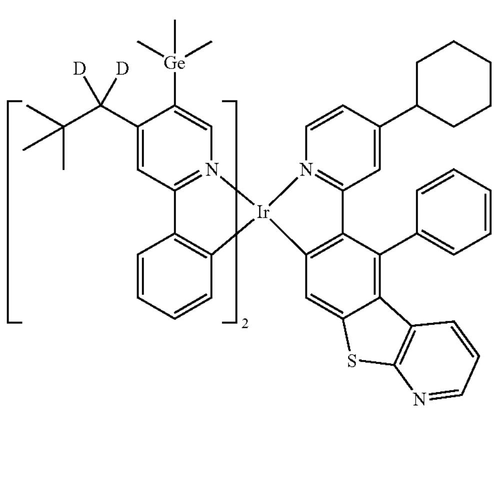
1476
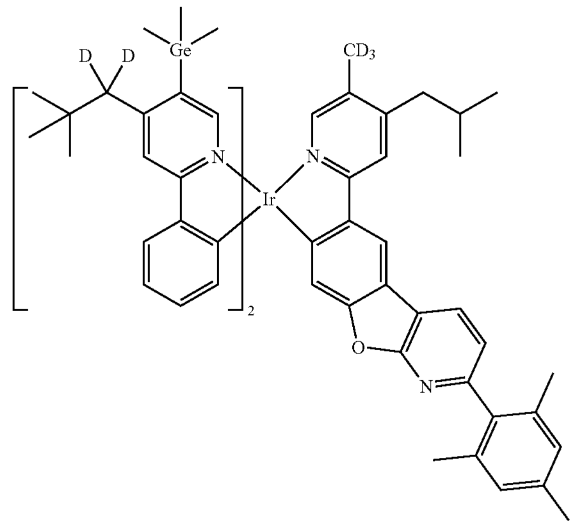
1477
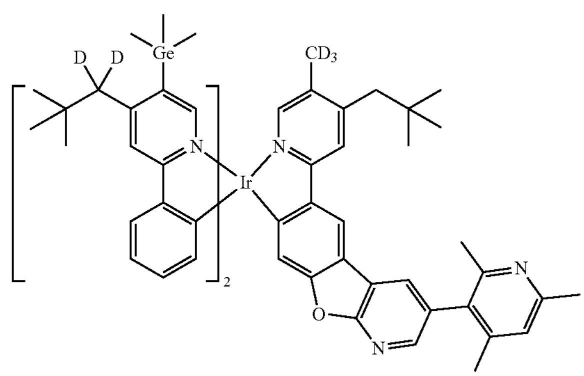
1478
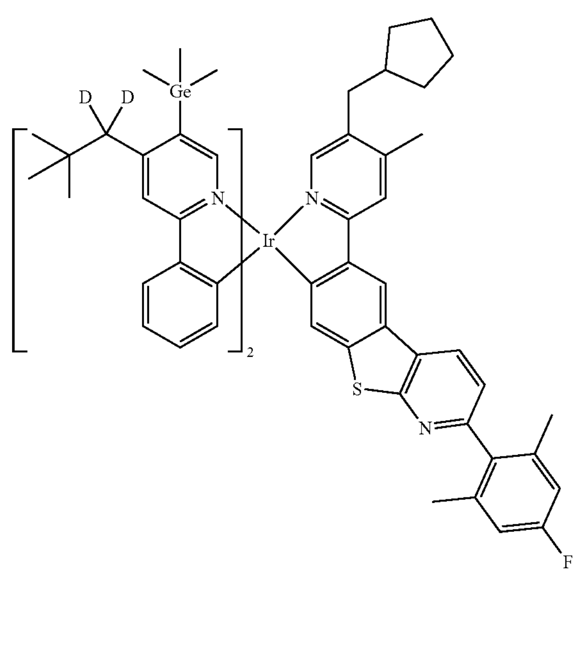

1479
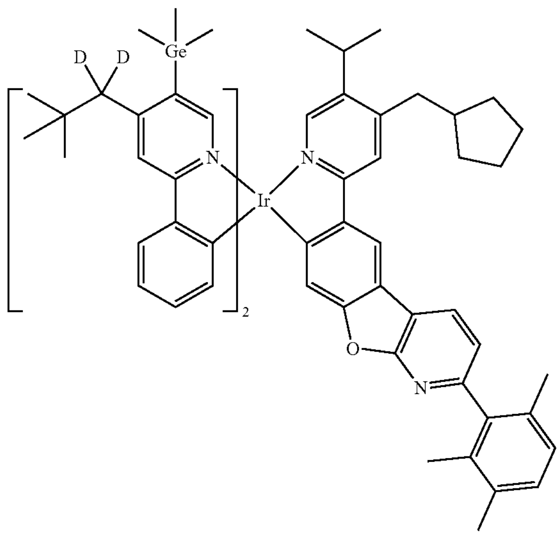
1480
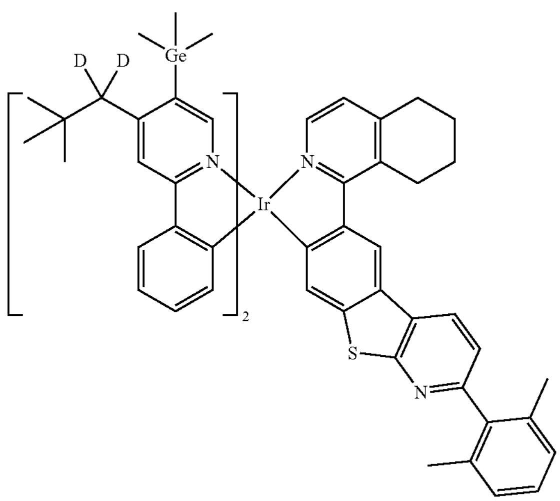
1481
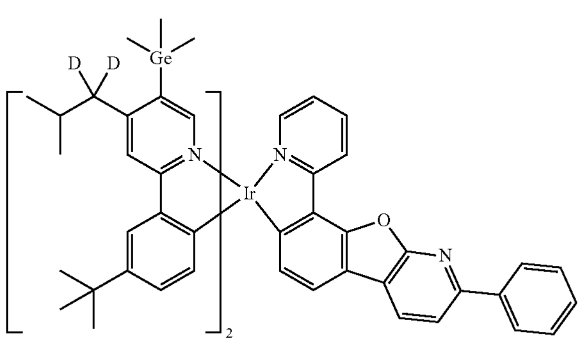
1482
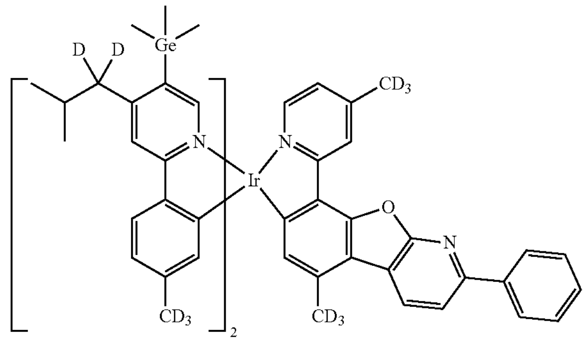
1483
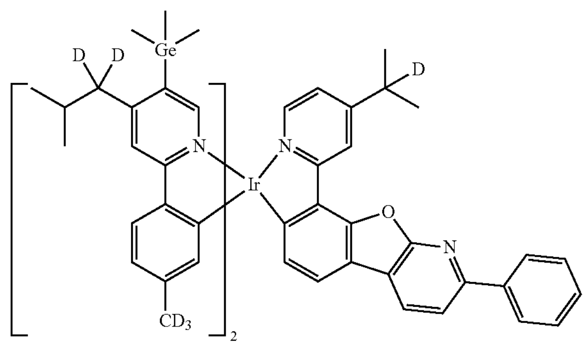
1484
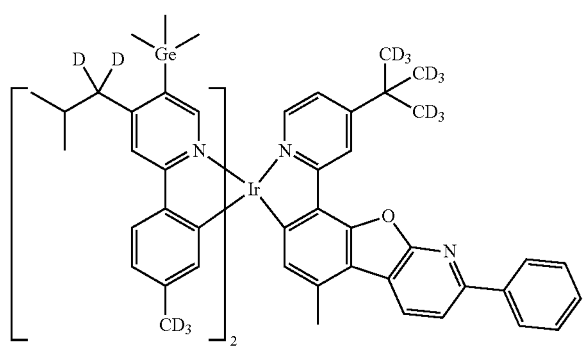
1485
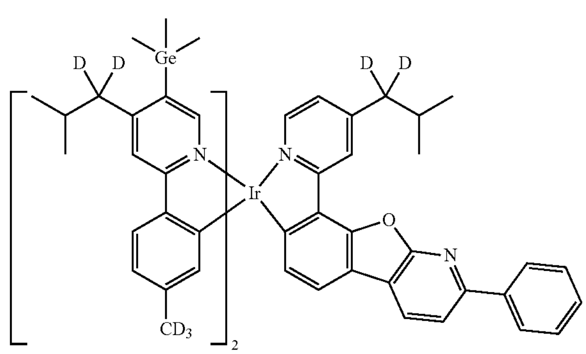

-continued
1486
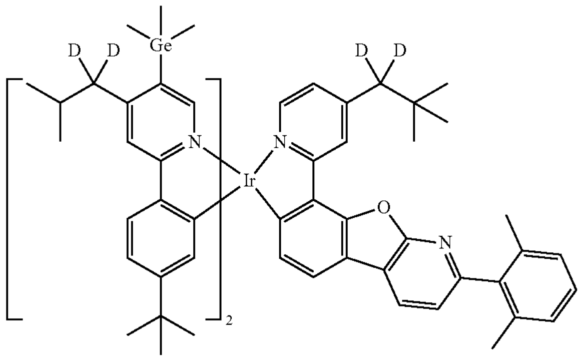
1487
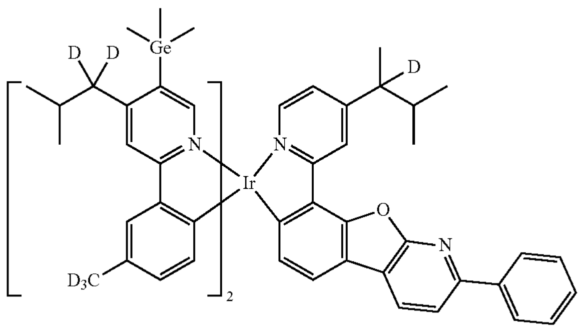
1488
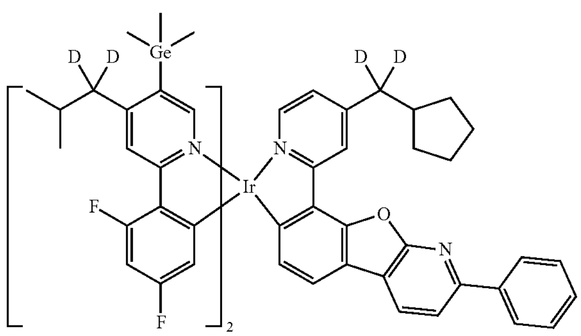
1489
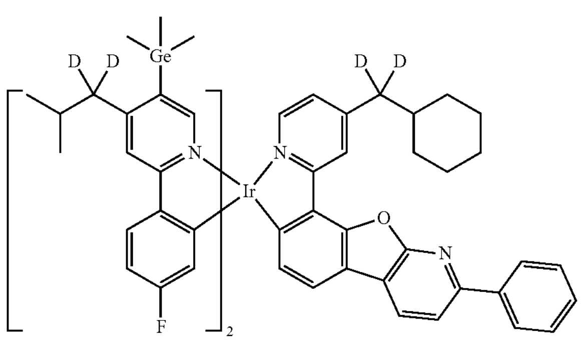
-continued
1490
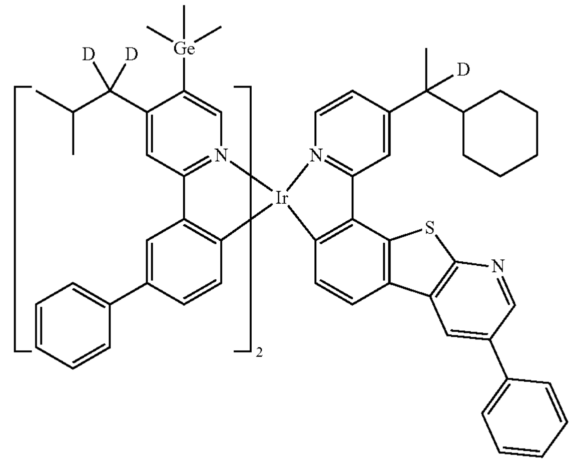
1491
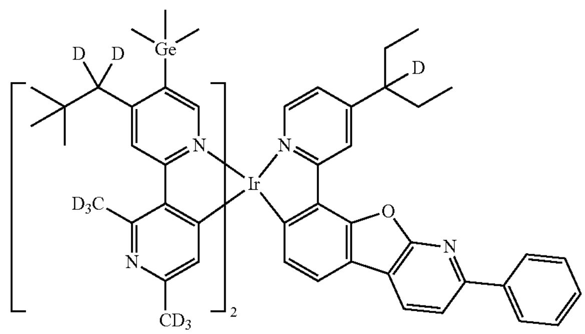
1492
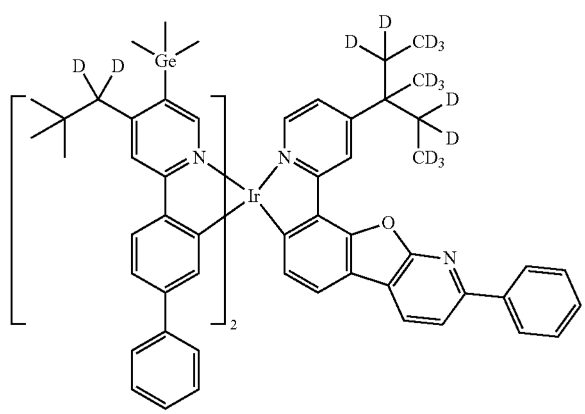

-continued
1493
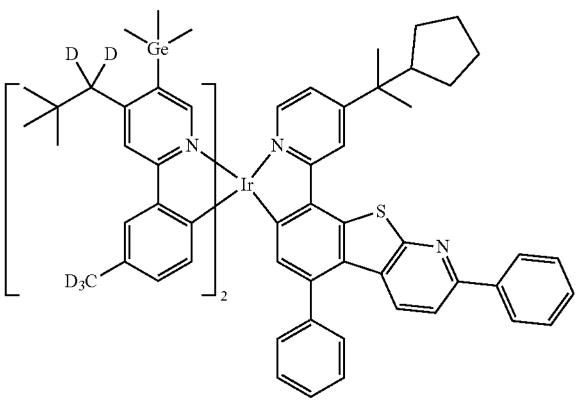
1494
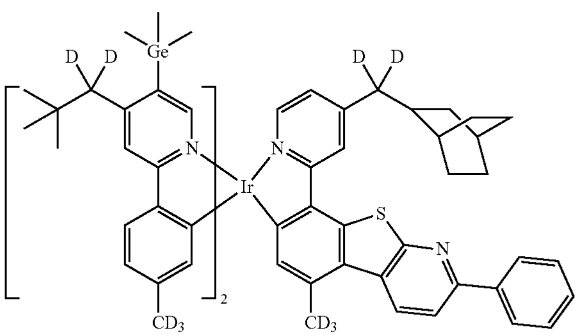
1495
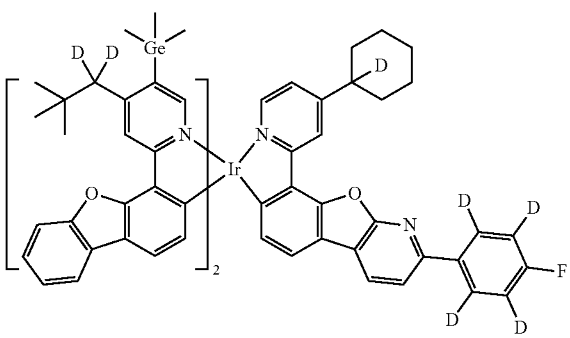
1496
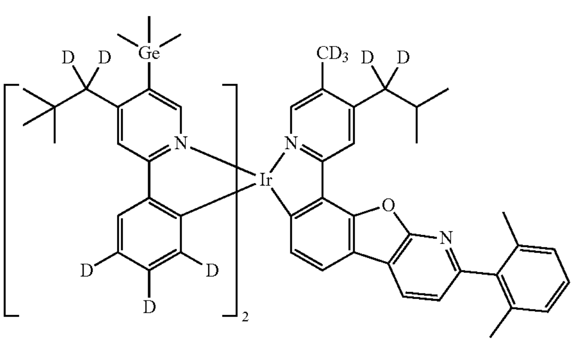
-continued
1497
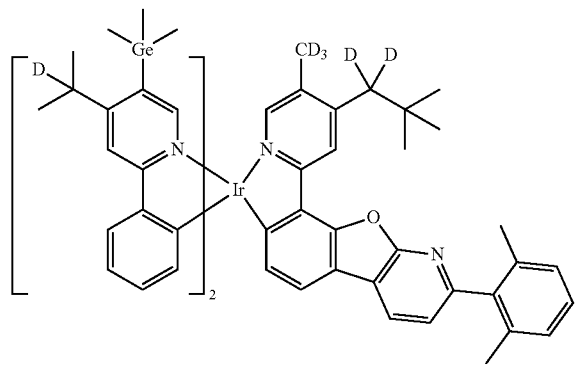
1498
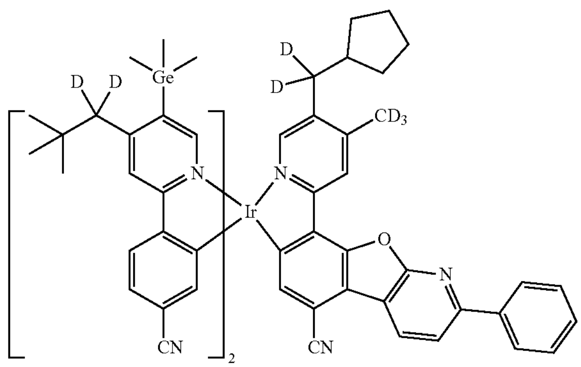
1499
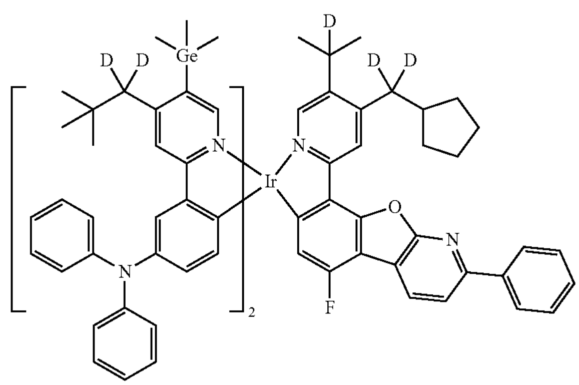
1500
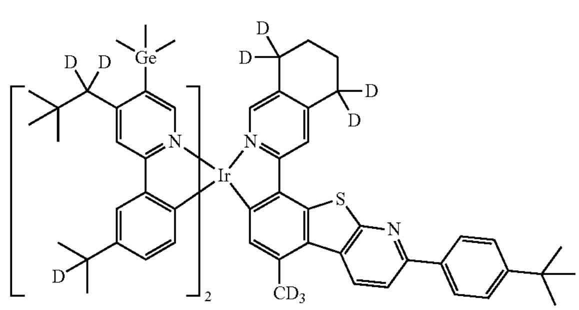

-continued
1501
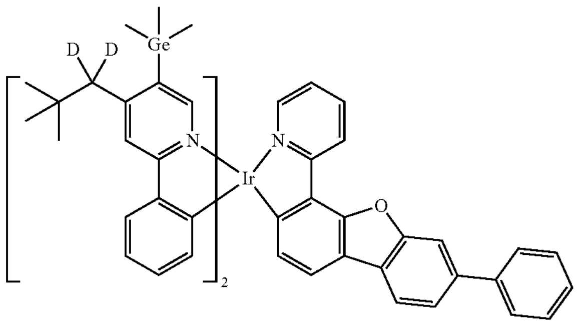
1502
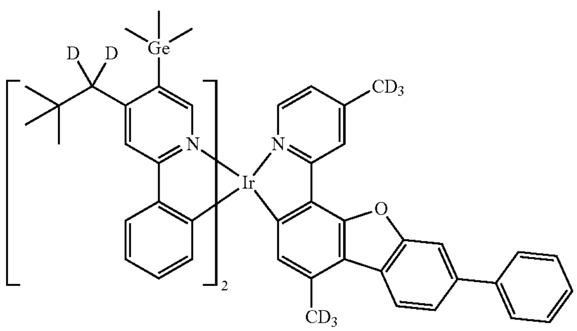
1503
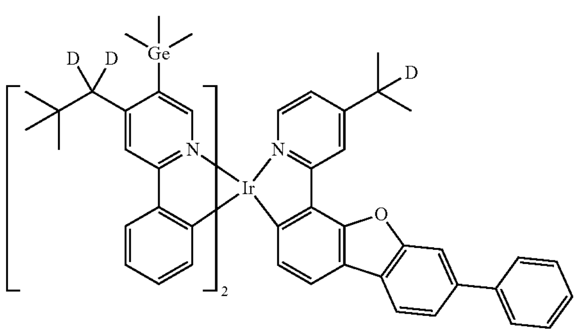
1504
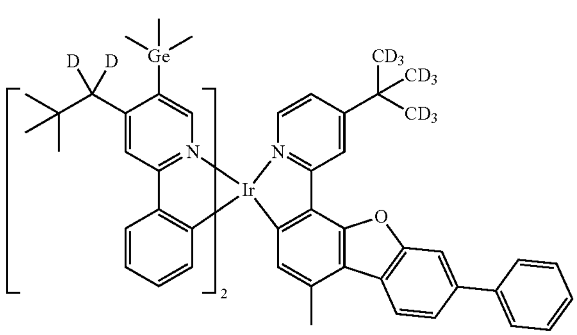
-continued
1505
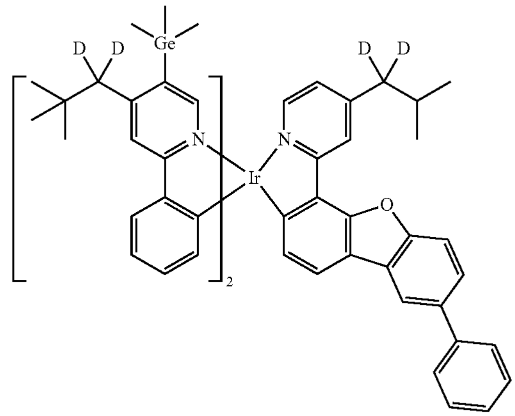
1506
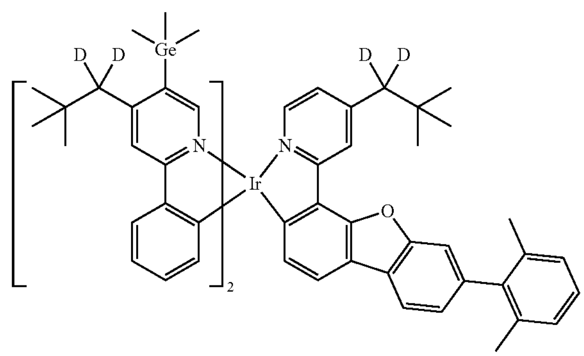
1507
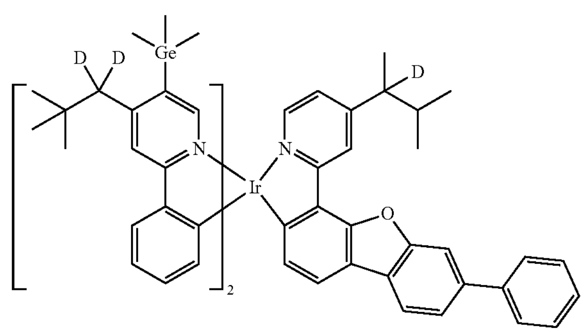
1508
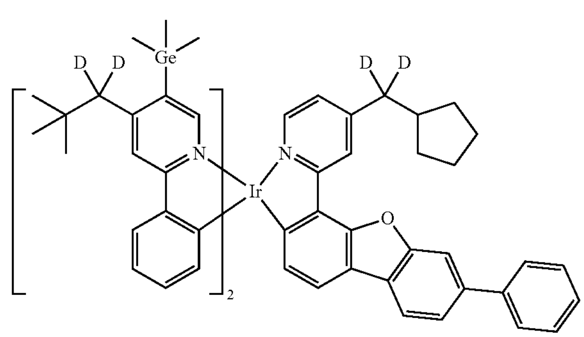

-continued
1509
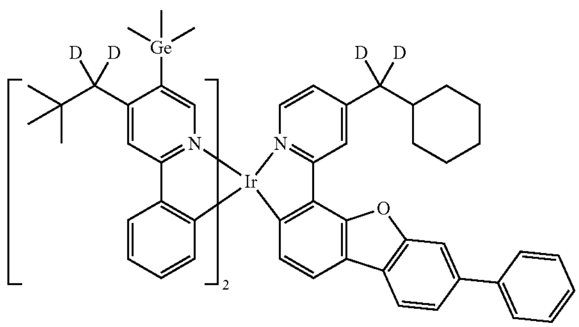
1510
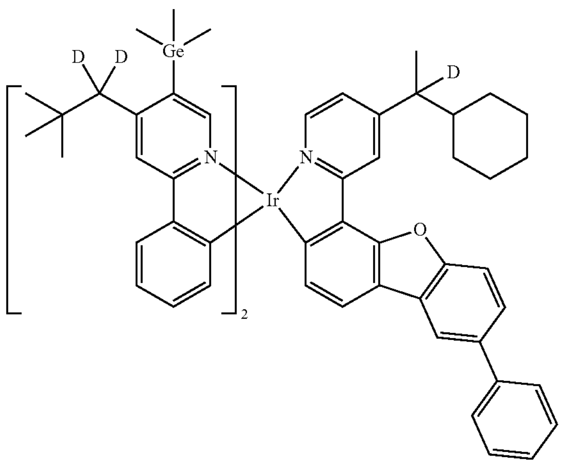
1511
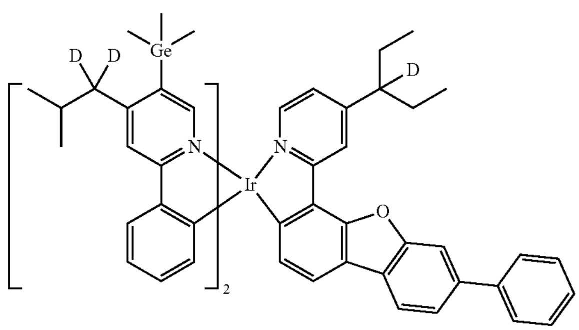
1512
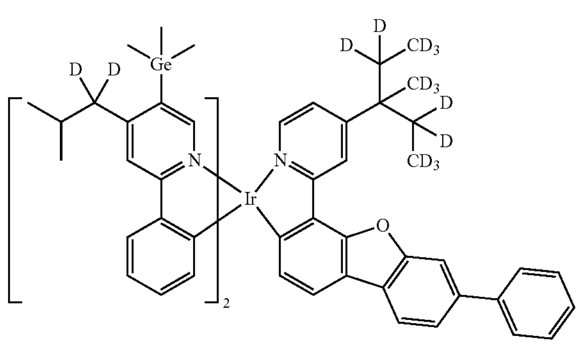
-continued
1513
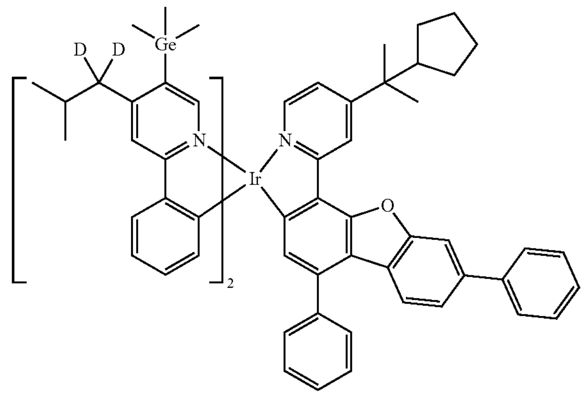
1514
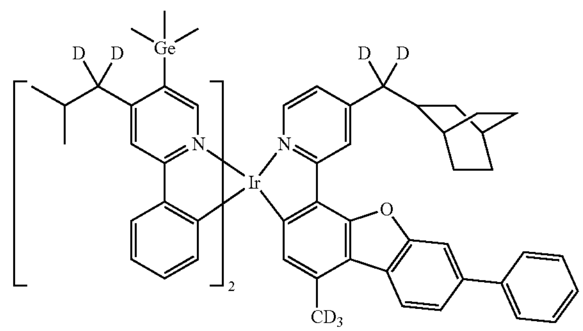
1515
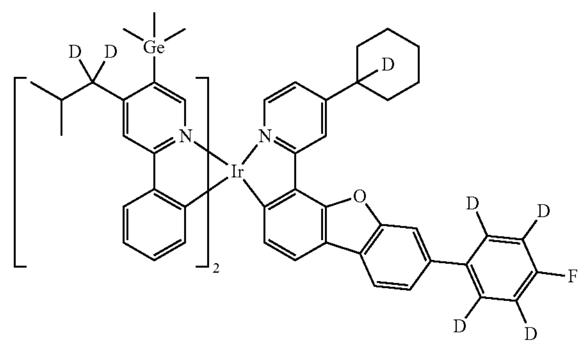
1516
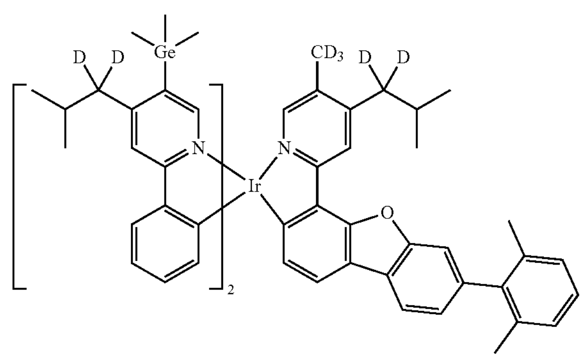

1517
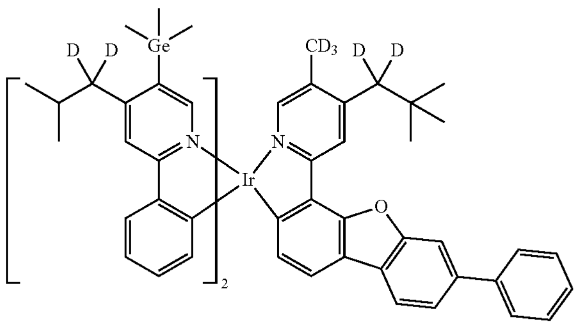
1518
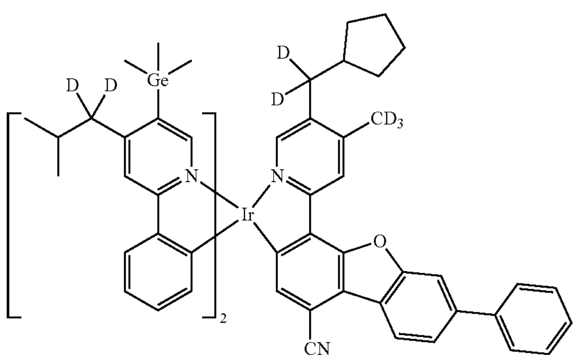
1519
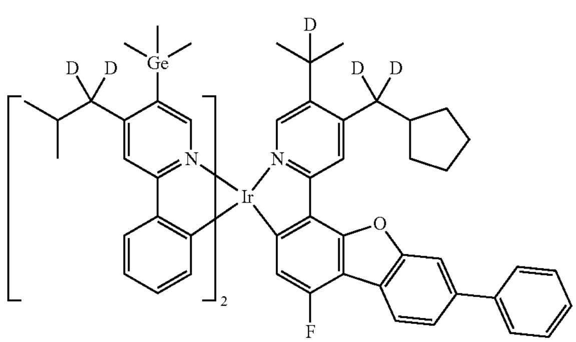
1520
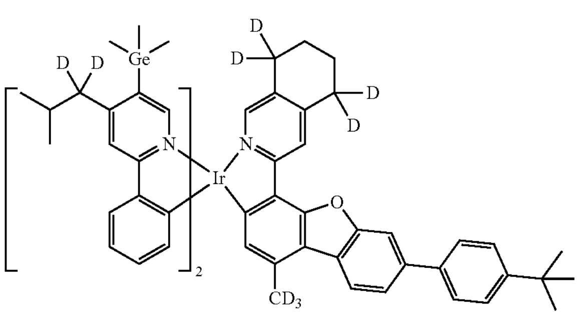
1521
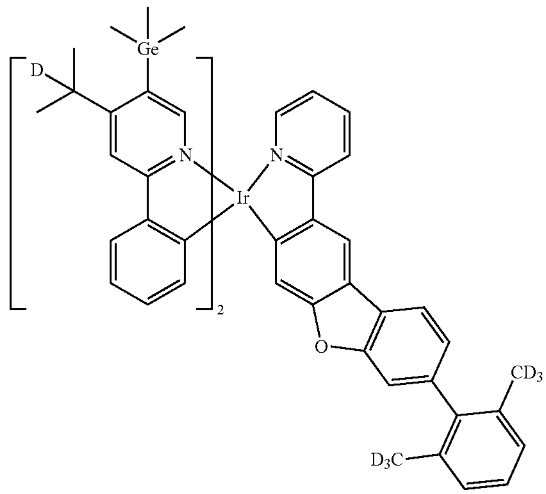
1522
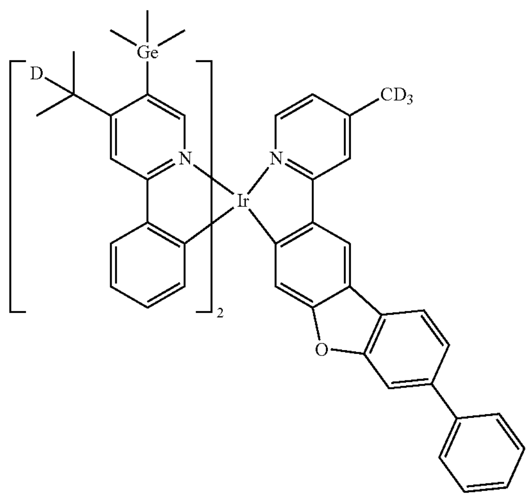
1523
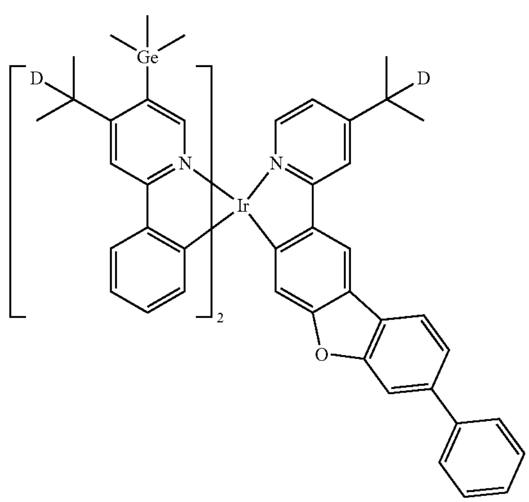

-continued
1524
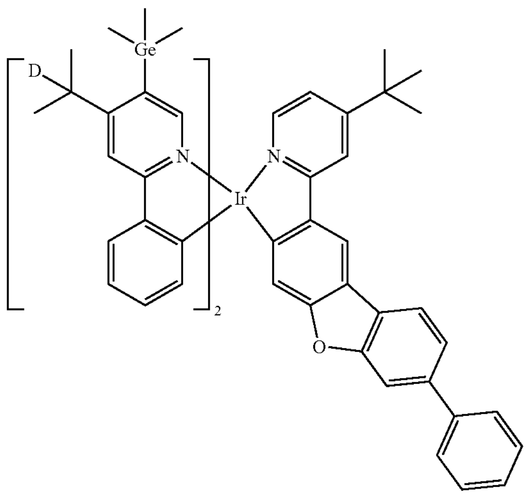
1525
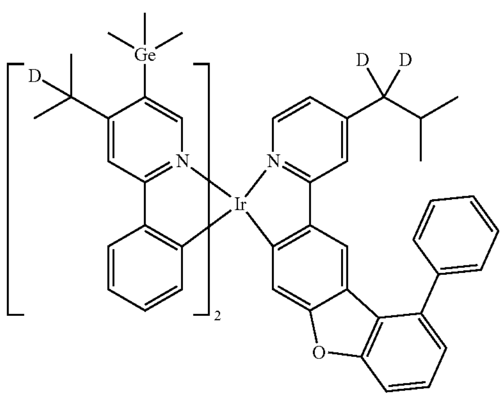
1526
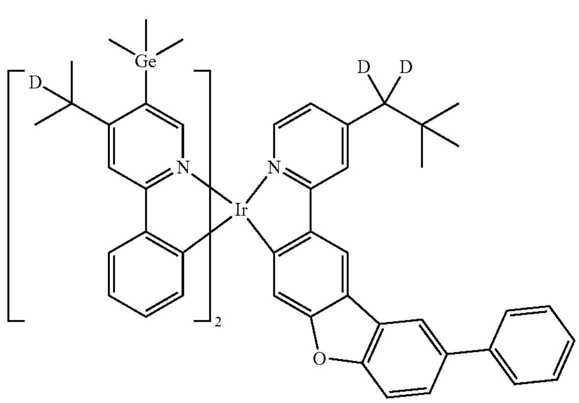
-continued
1527
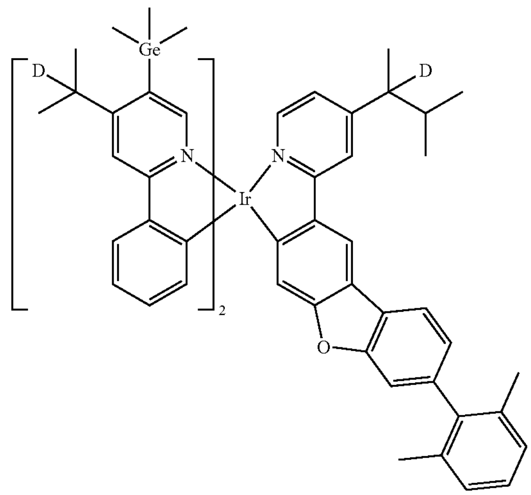
1528
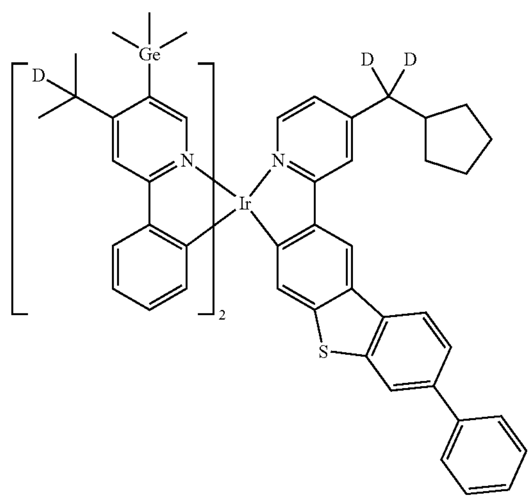
1529
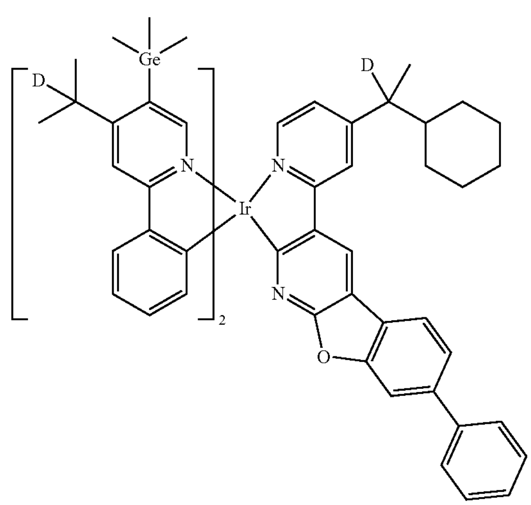

-continued
1530
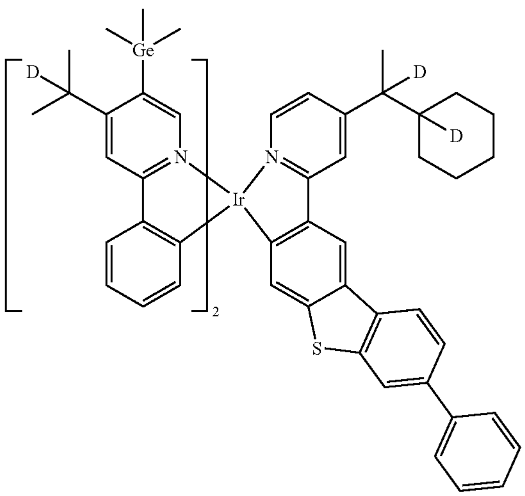
1531
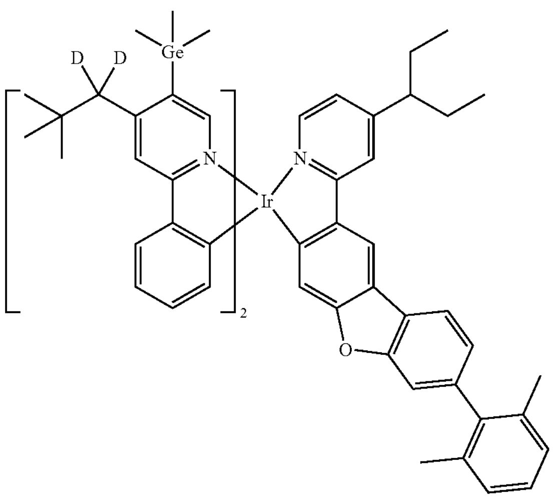
1532
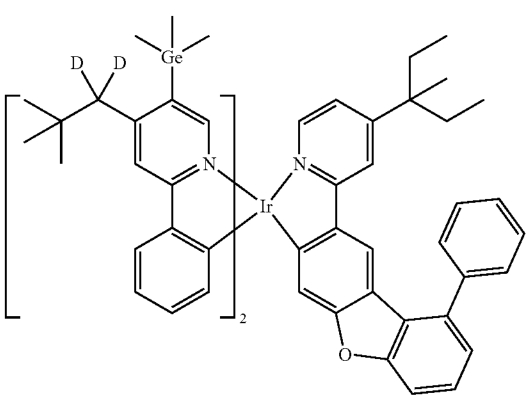
-continued
1533
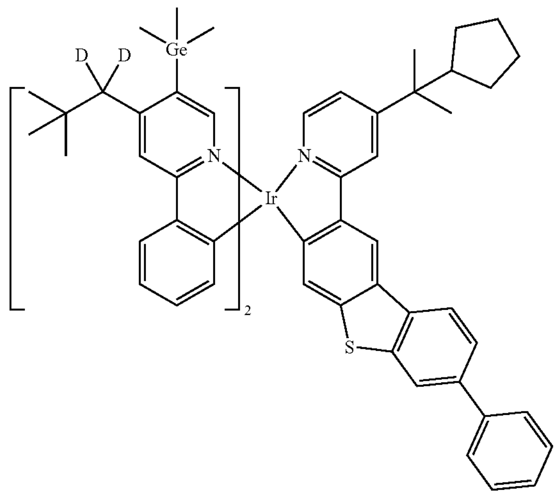
1534
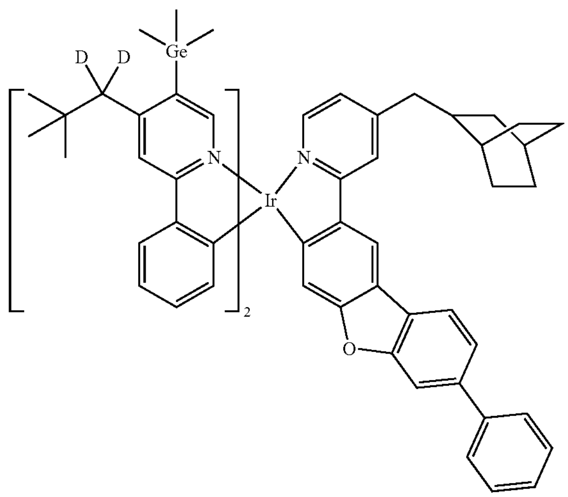
1535
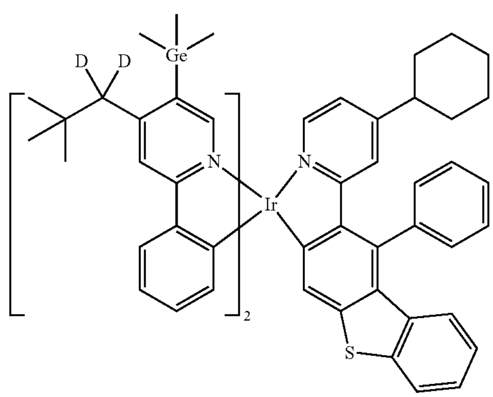

-continued
1536
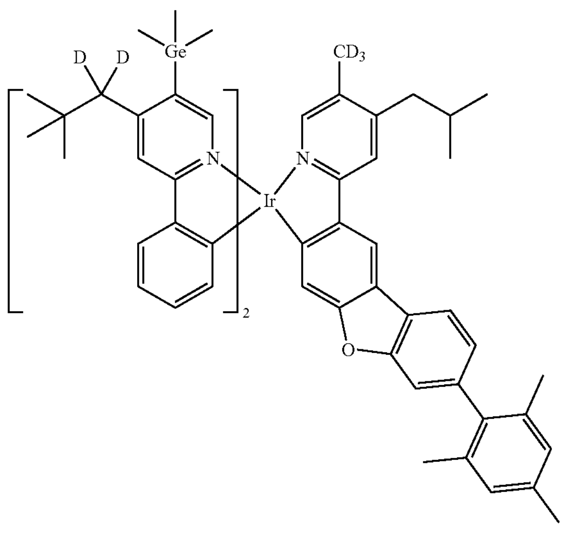
1537
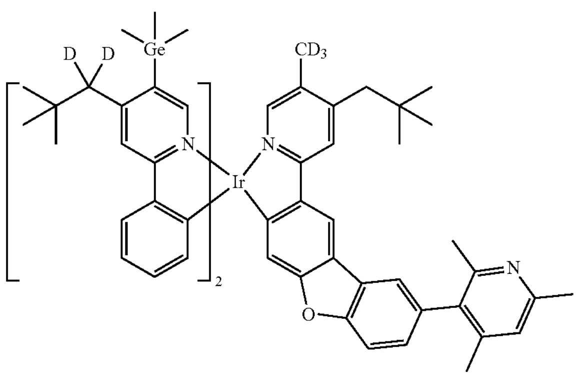
1538
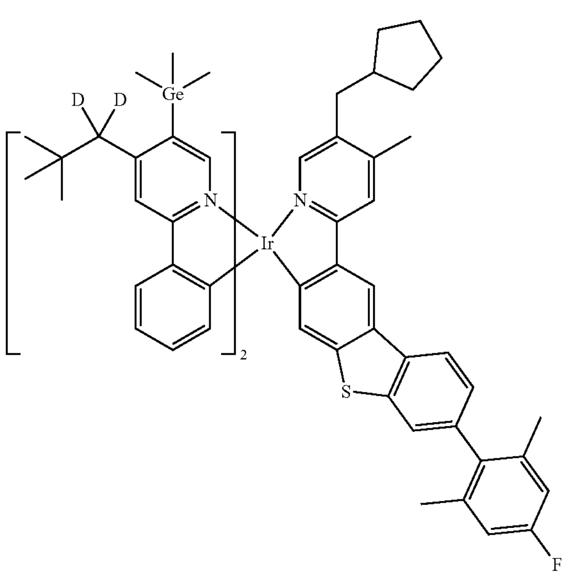
-continued
1539
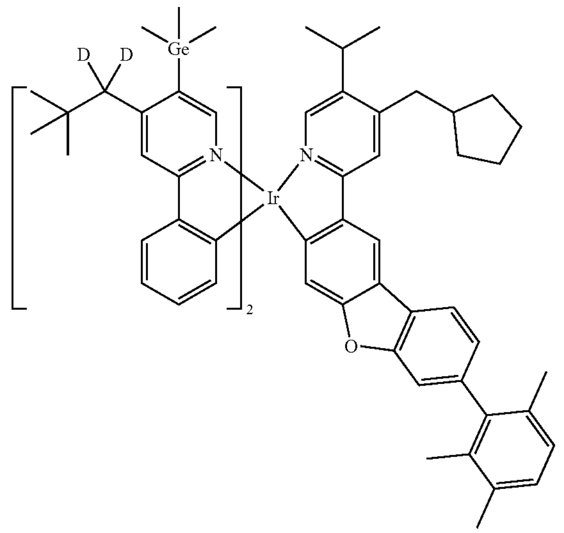
1540
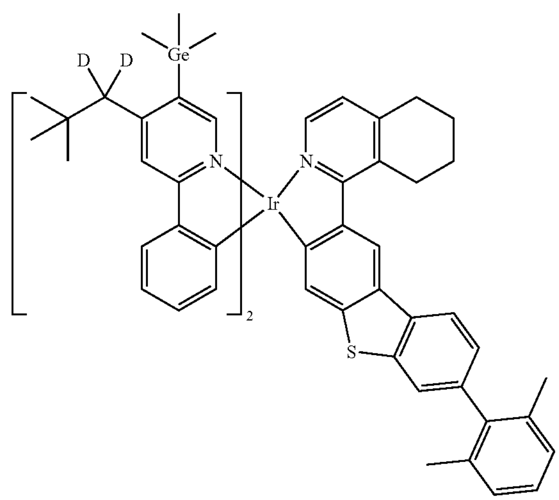
1541
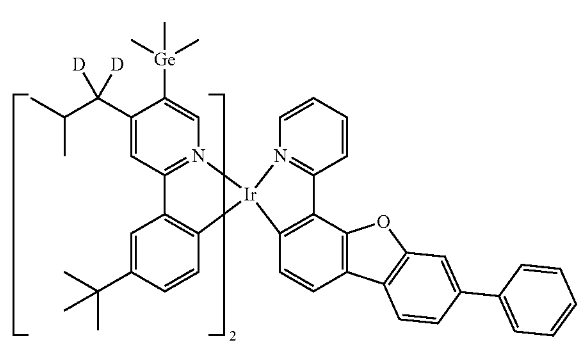

-continued
1542
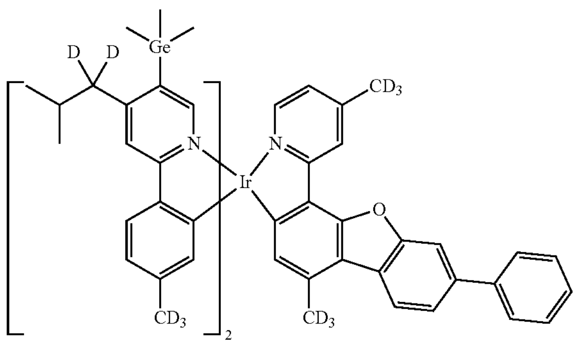
1543
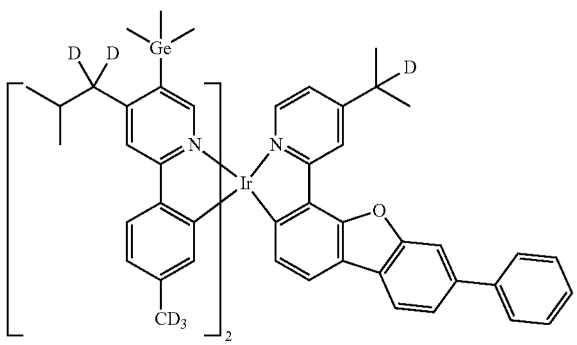
1544
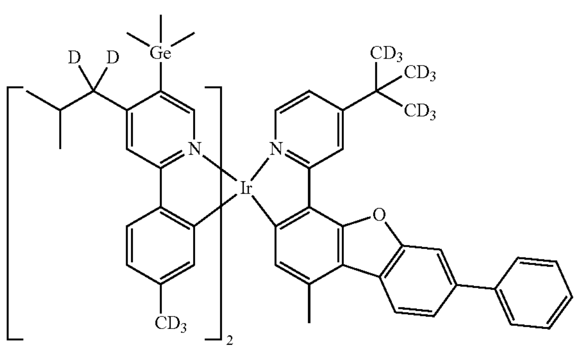
1545
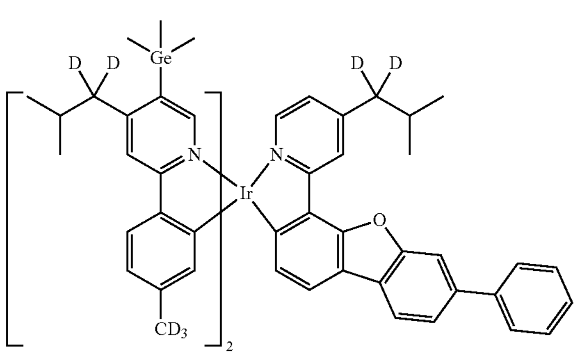
-continued
1546
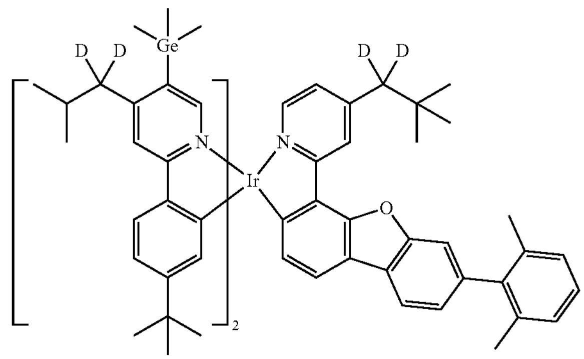
1547
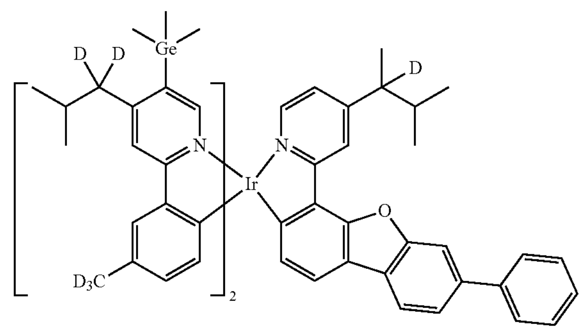
1548
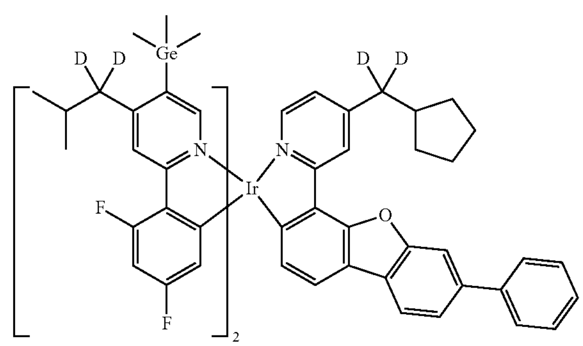
1549
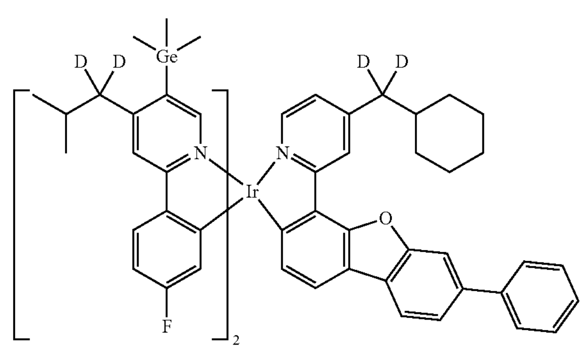

-continued
1550
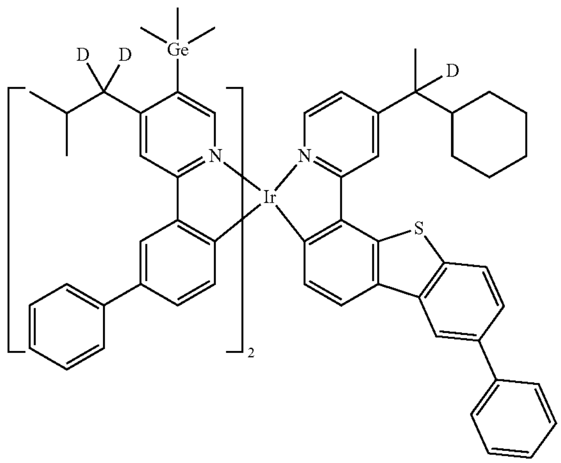
1551
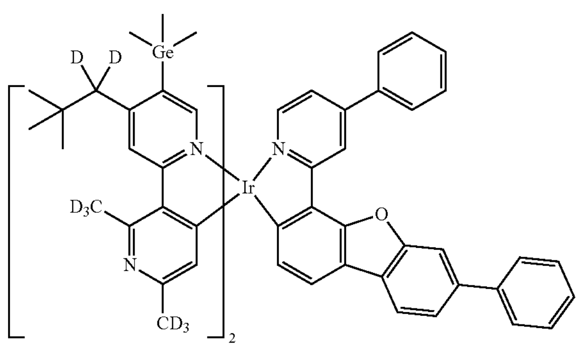
1552
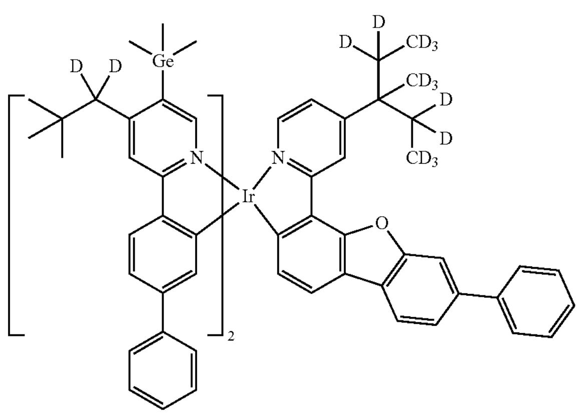
-continued
1553
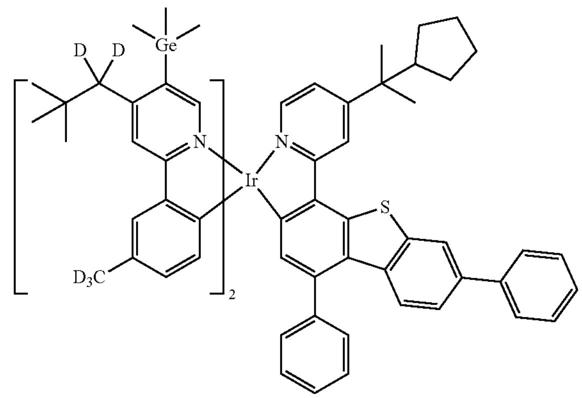
1554
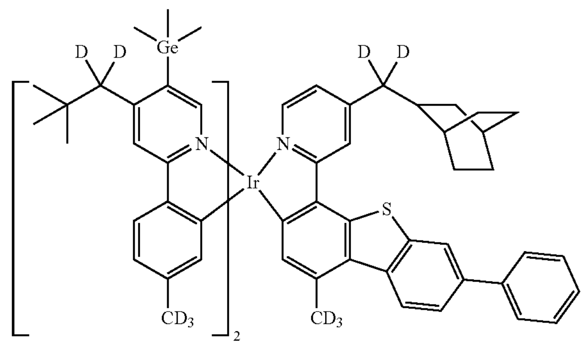
1555
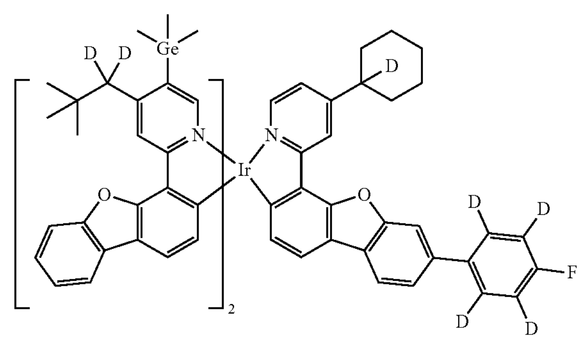
1556
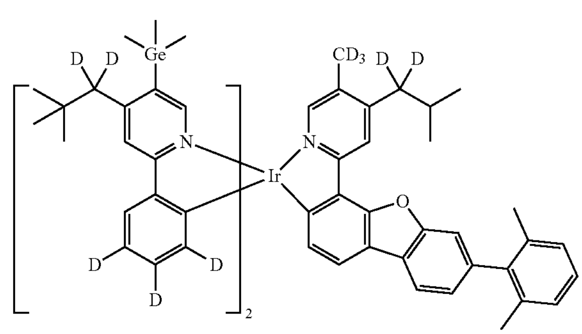

-continued
1557
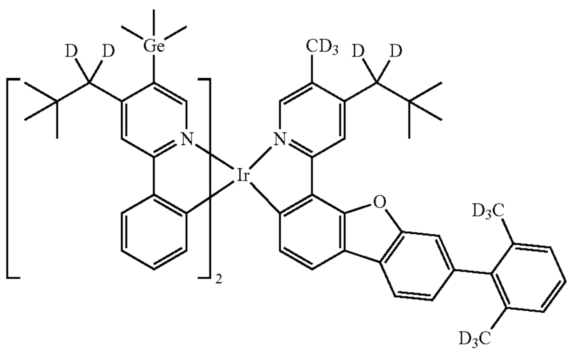
1558
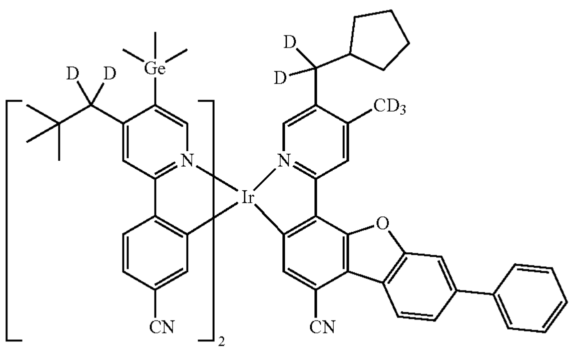
1559
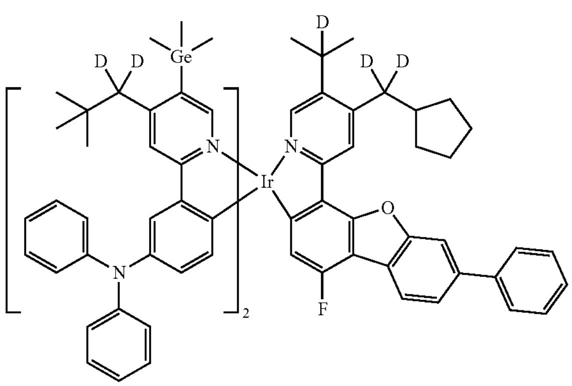
1560
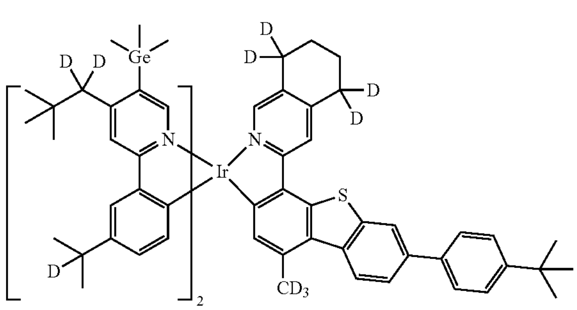
-continued
1561
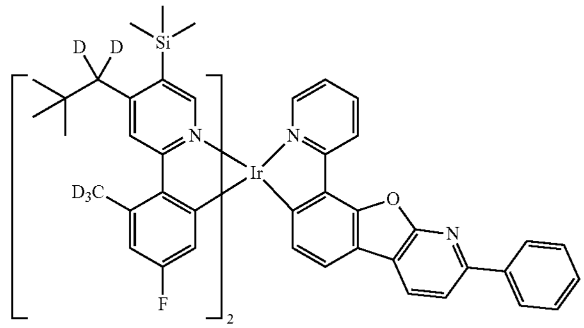
1562
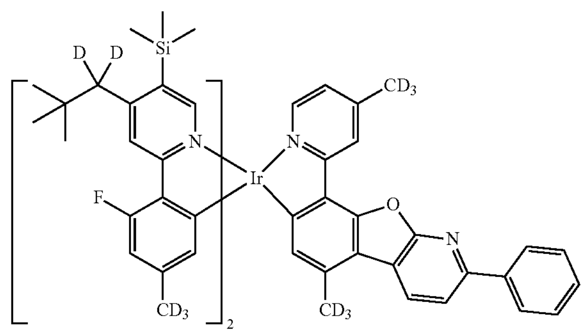
1563
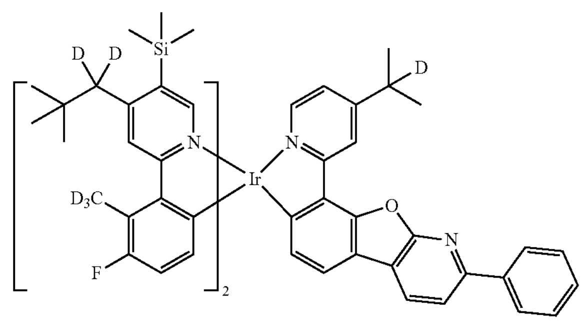
1564
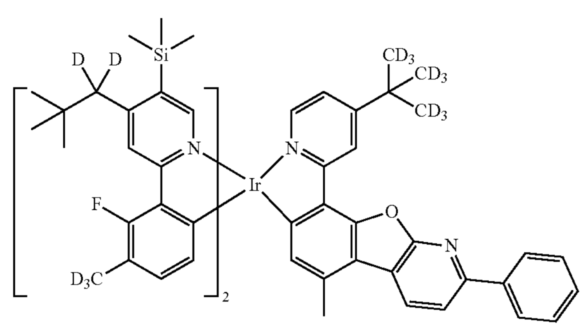

-continued
1565
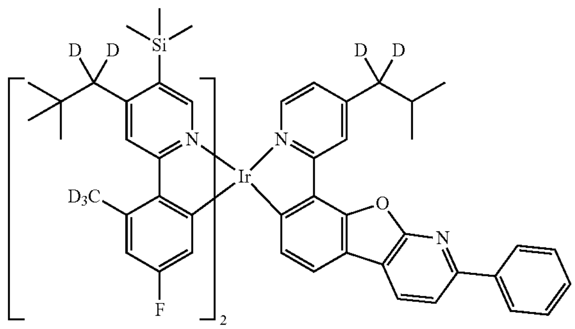
1566
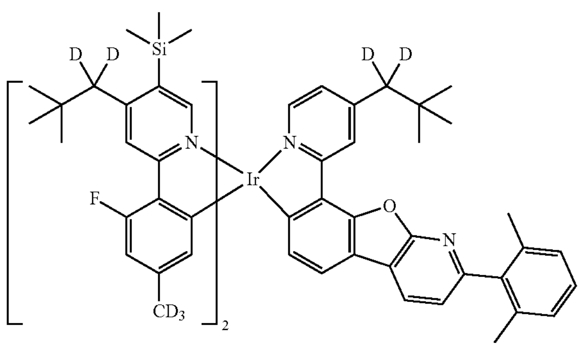
1567
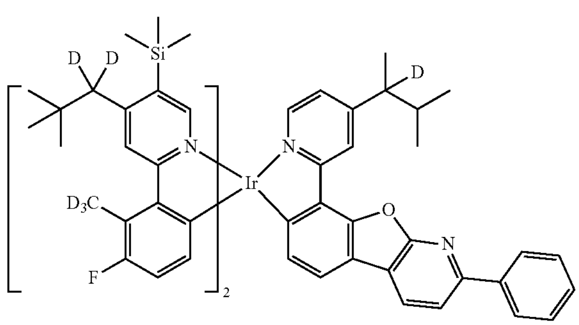
1568
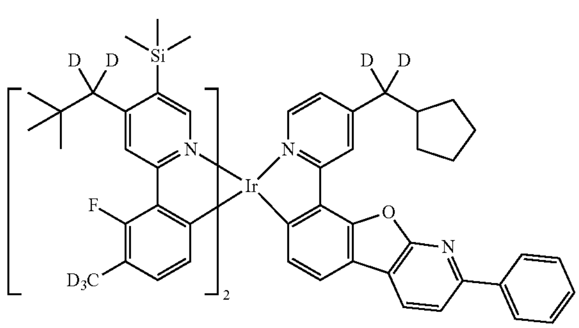
-continued
1569
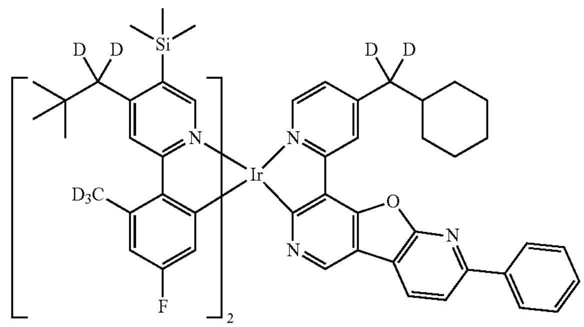
1570
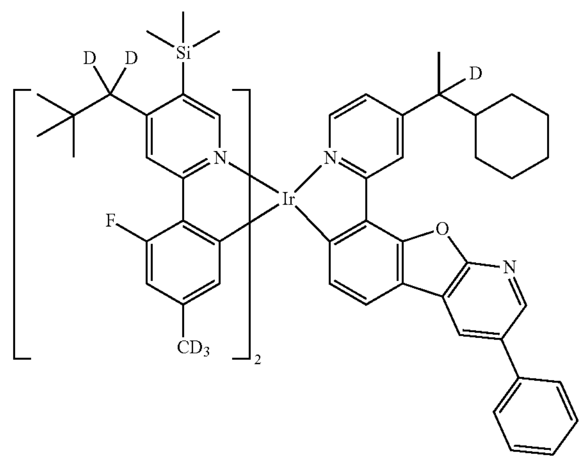
1571
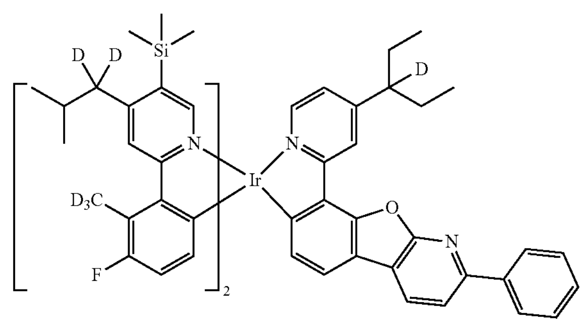
1572
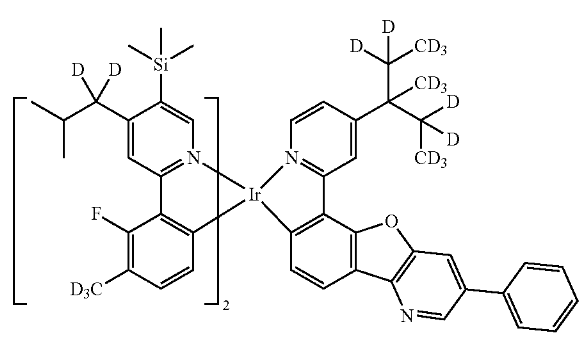

-continued
1573
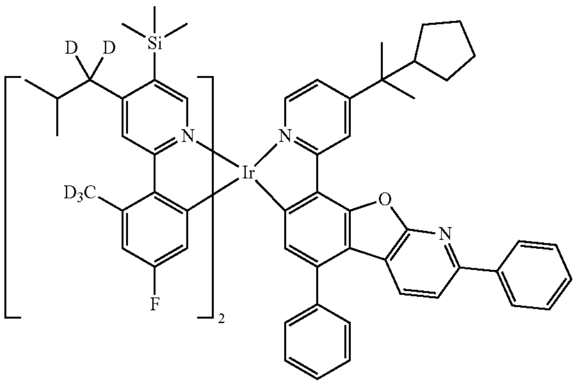
1574
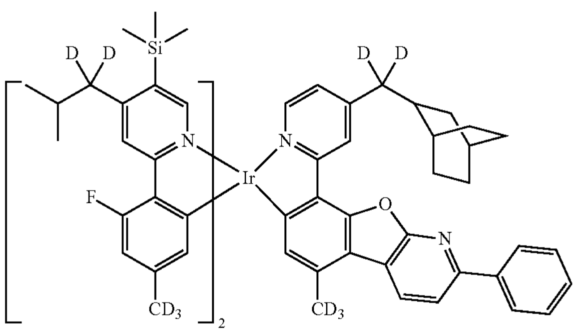
1575
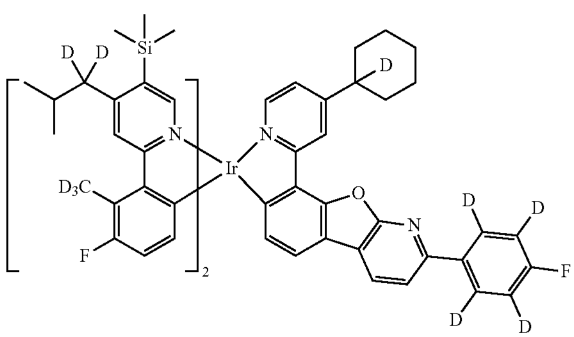
1576
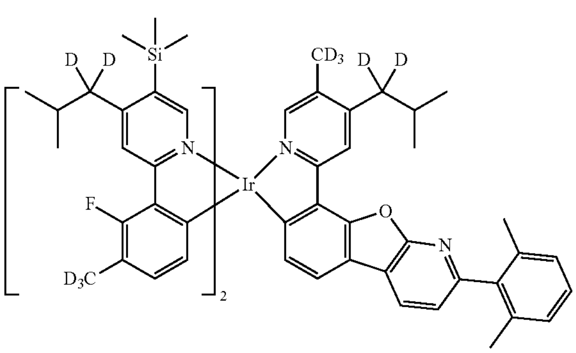
-continued
1577
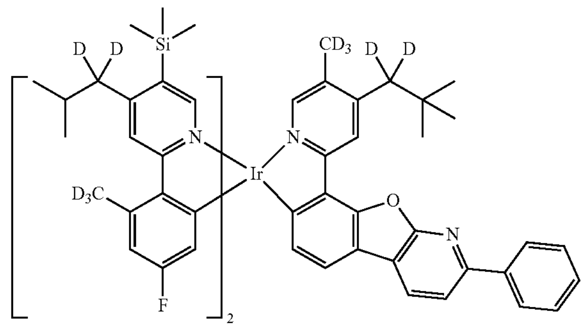
1578
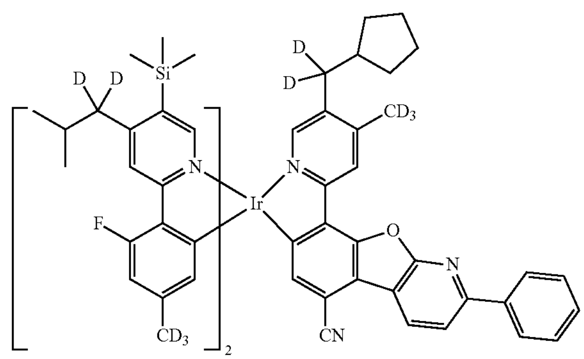
1579
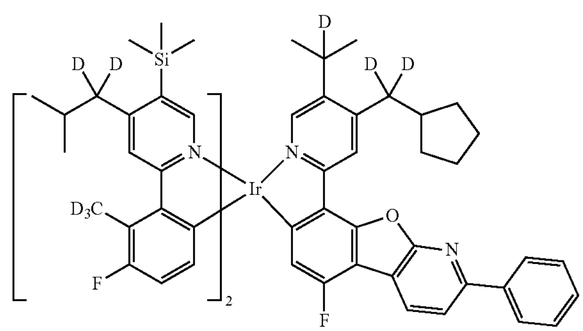
1580
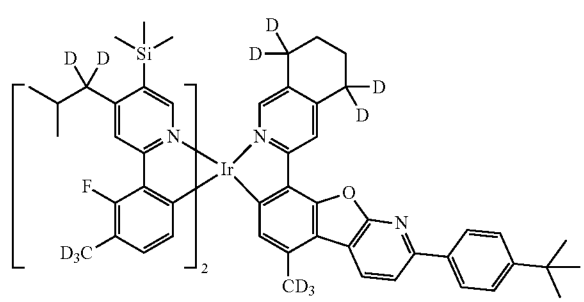

-continued
1581
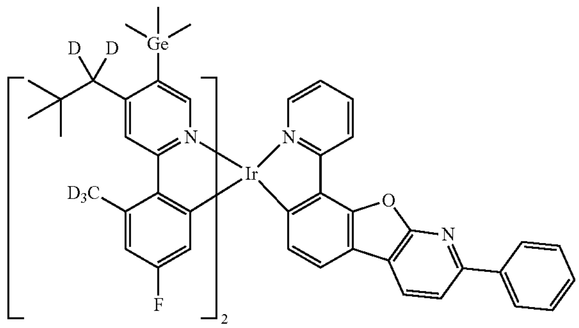
1582
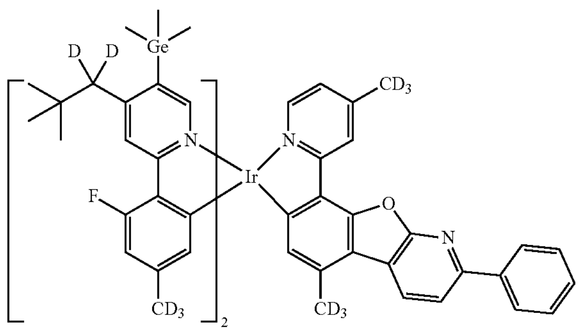
1583
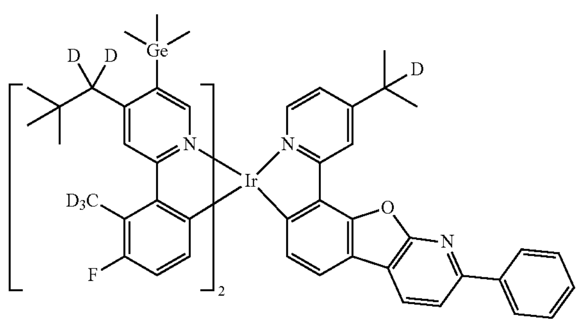
1584
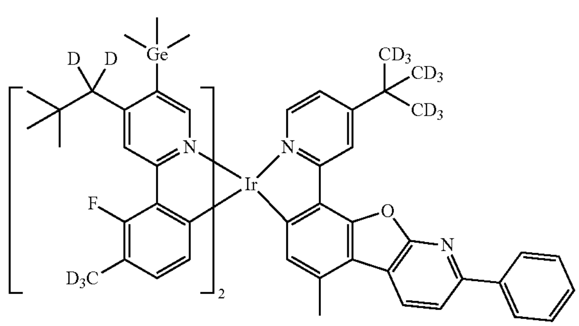
-continued
1585
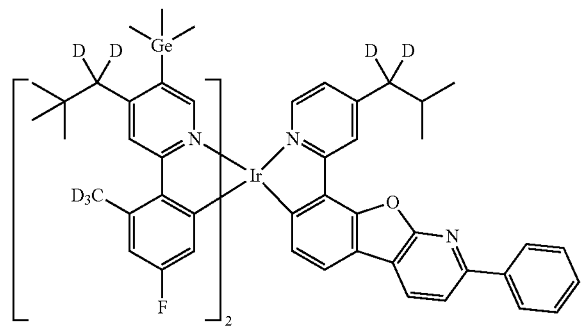
1586
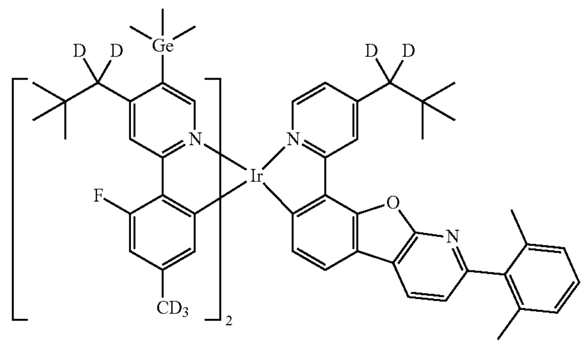
1587
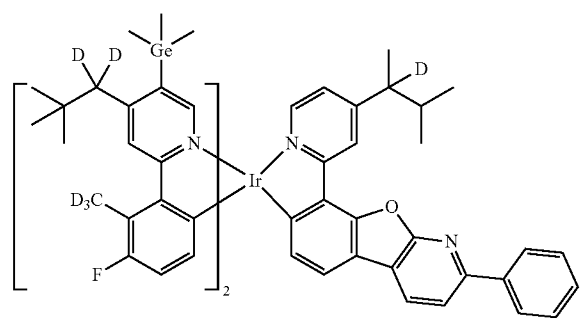
1588
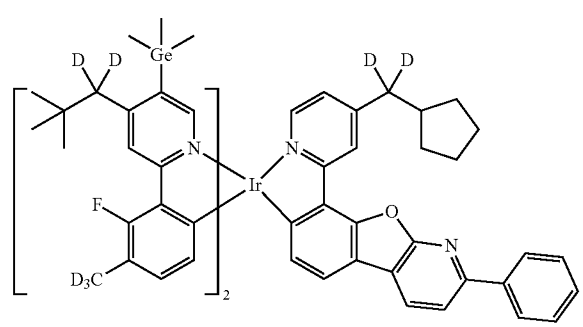

-continued
1589
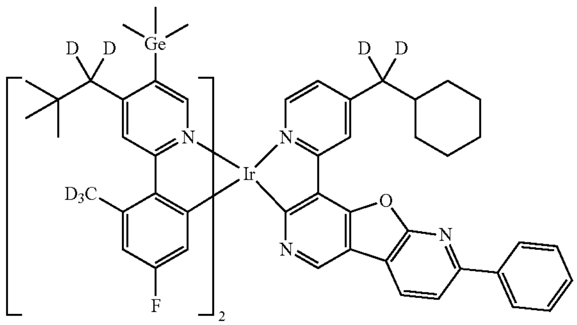
1590
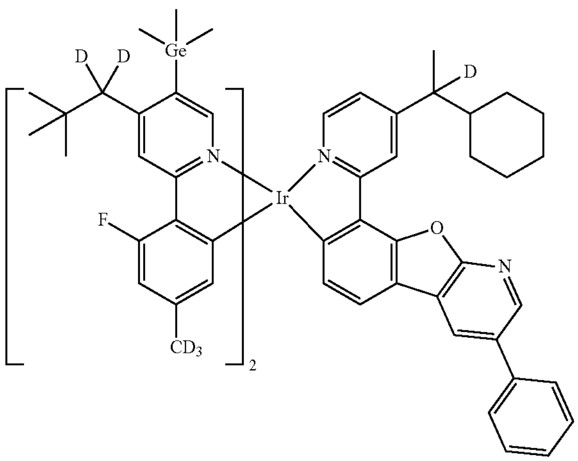
1591
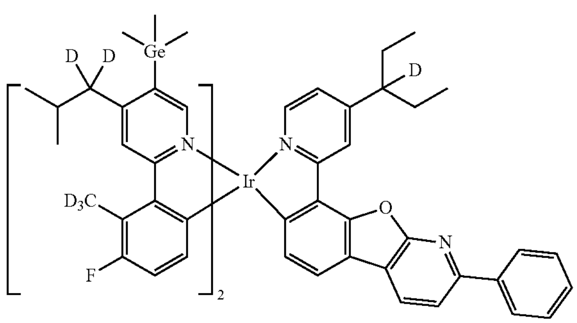
1592
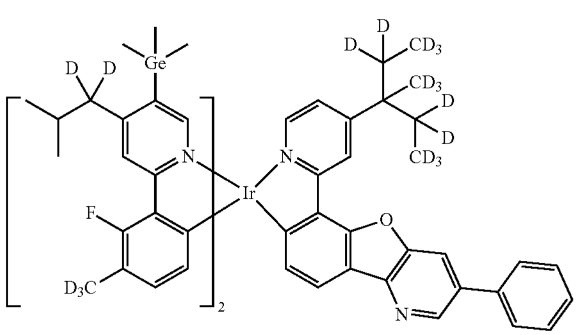
-continued
1593
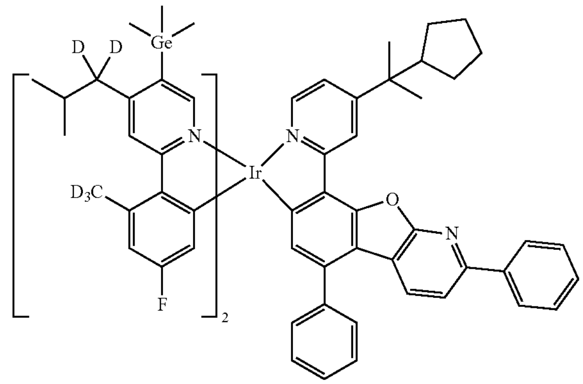
1594
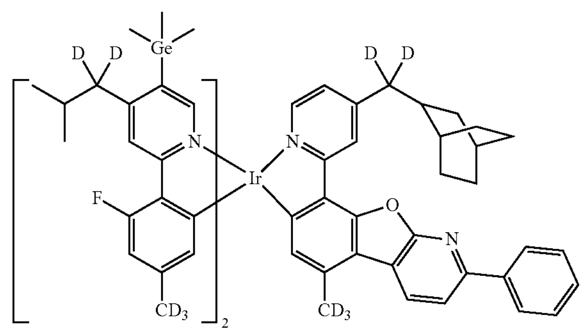
1595
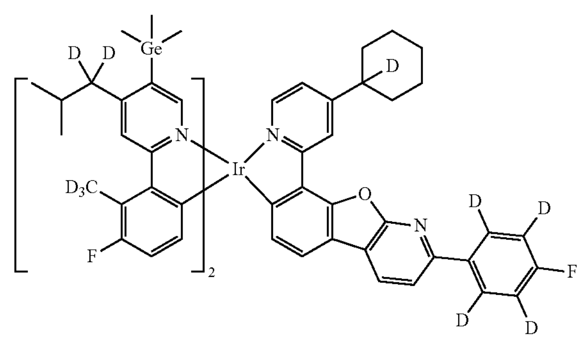
1596
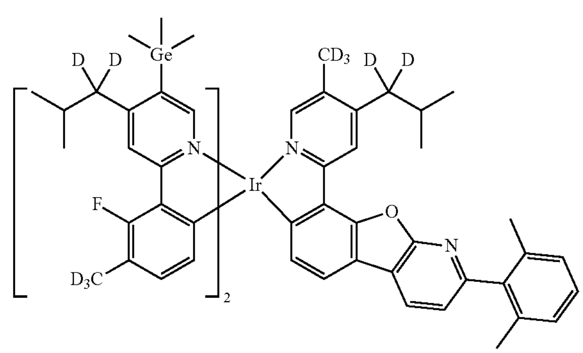

-continued
1597
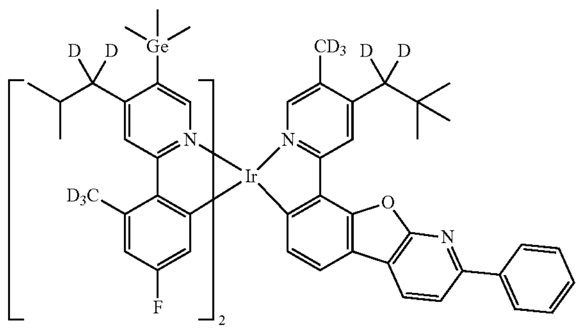
1598
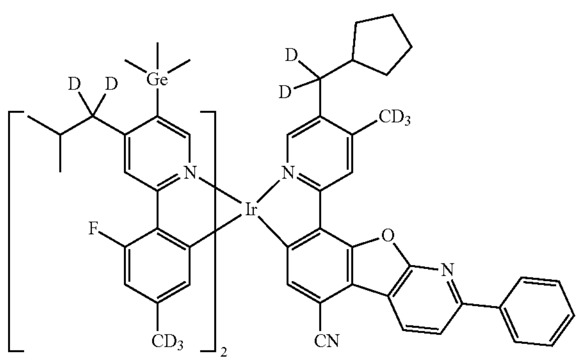
1599
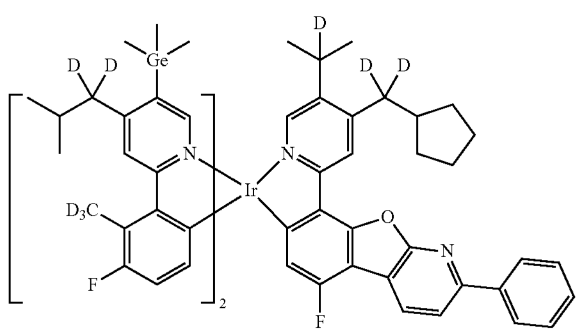
1600
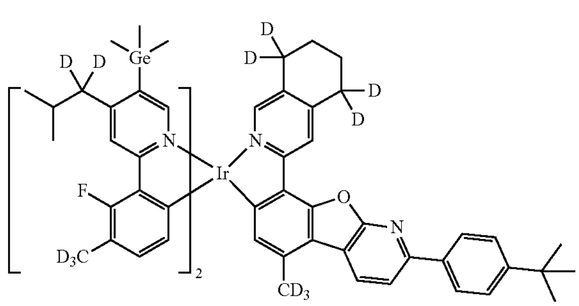
-continued
1601
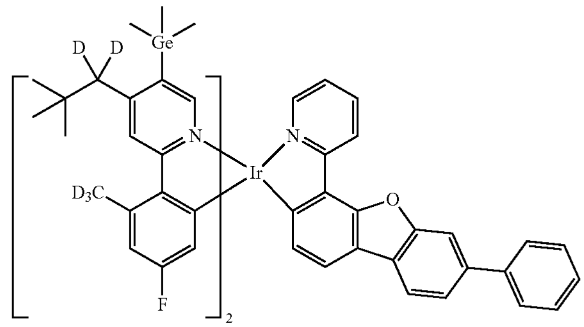
1602
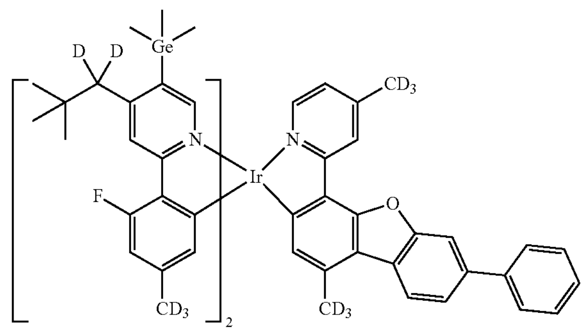
1603
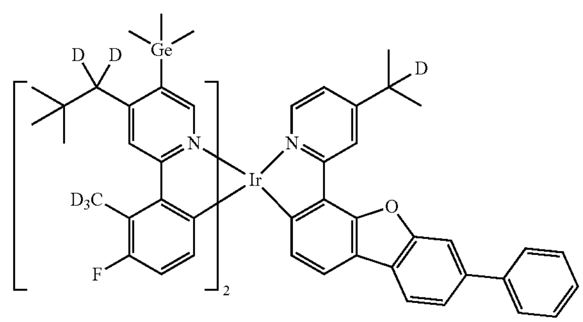
1604
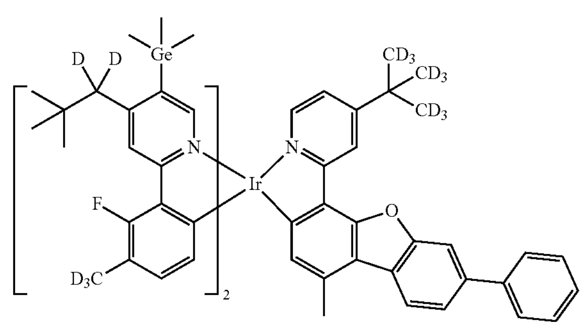

1605
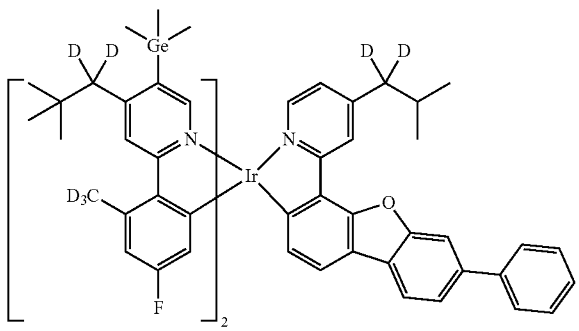
1606
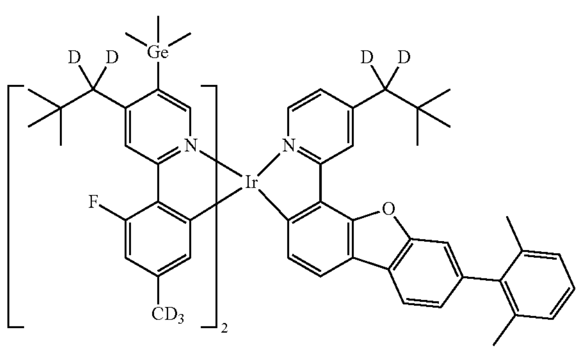
1607
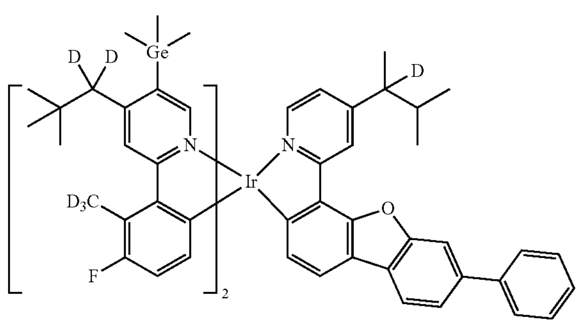
1608
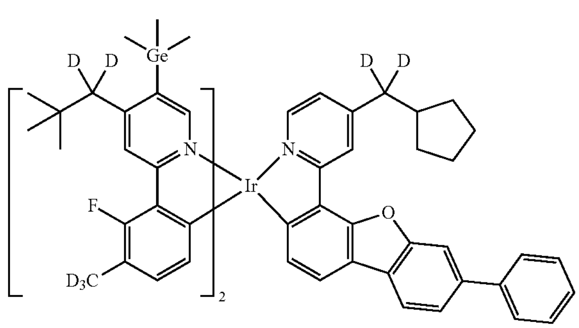
1609
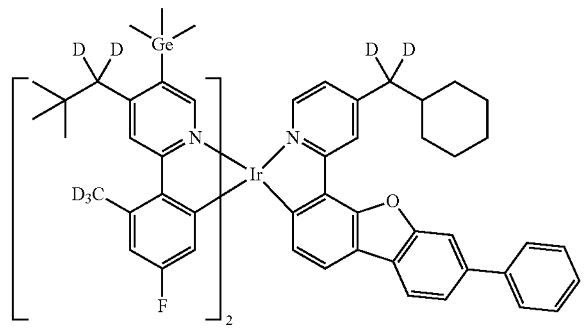
1610
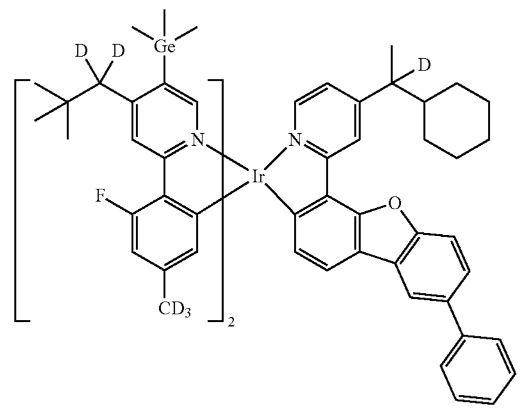
1611
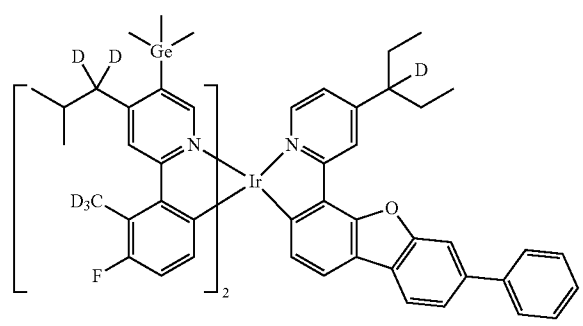
1612
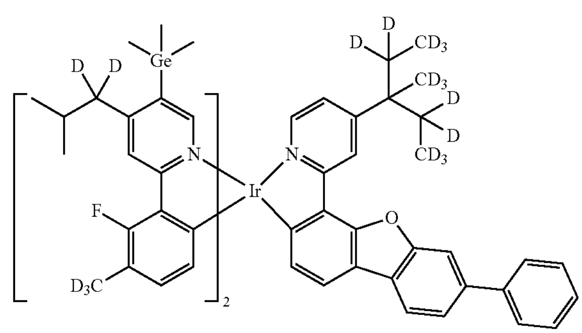

-continued
1613
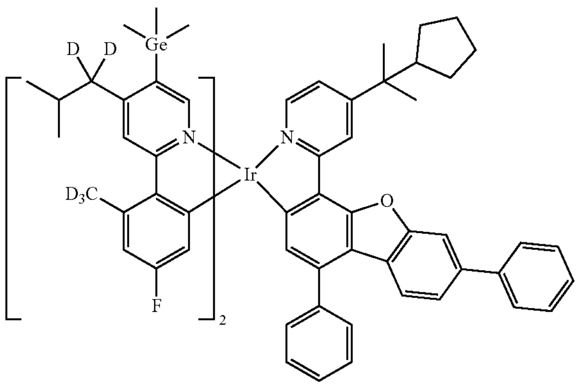
1614
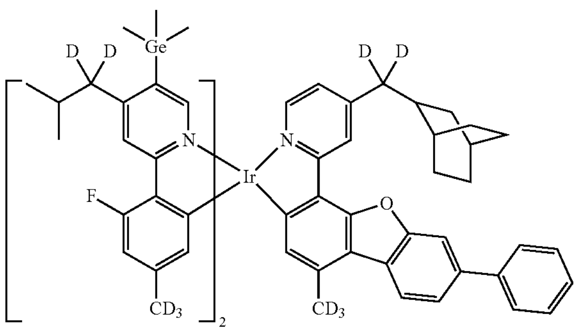
1615
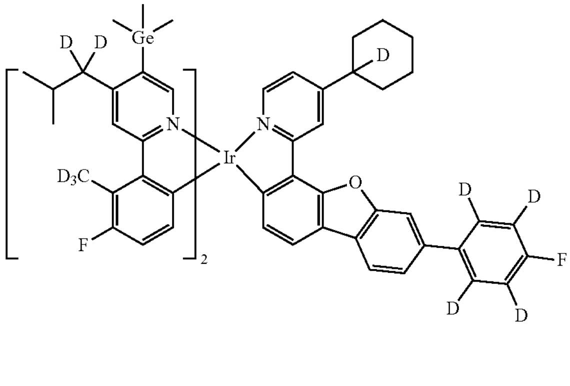
1616
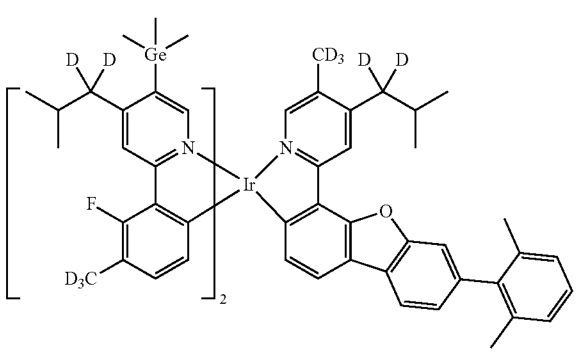
-continued
1617
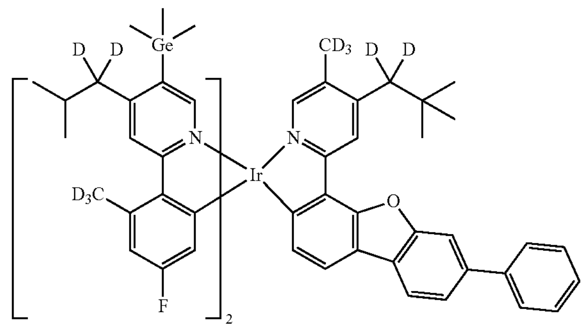
1618
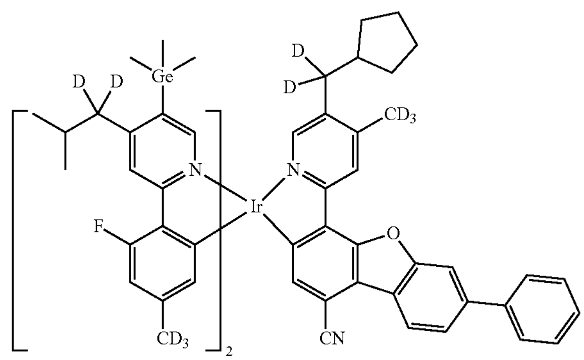
1619
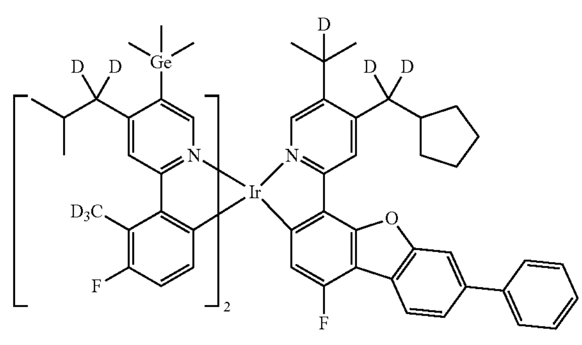
1620
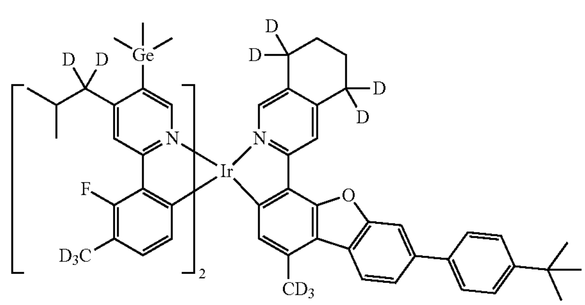

Group 1-3
1
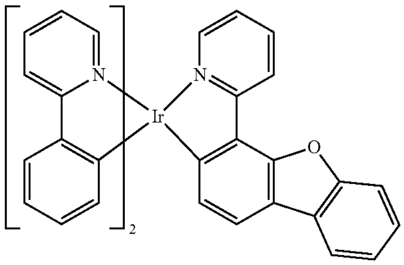
2
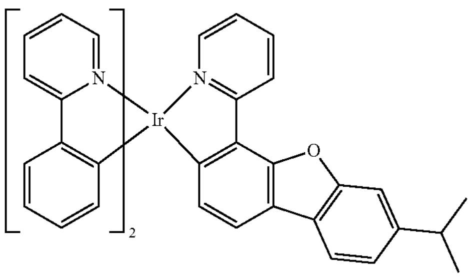
3
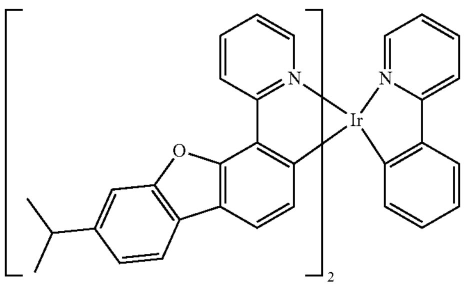
4
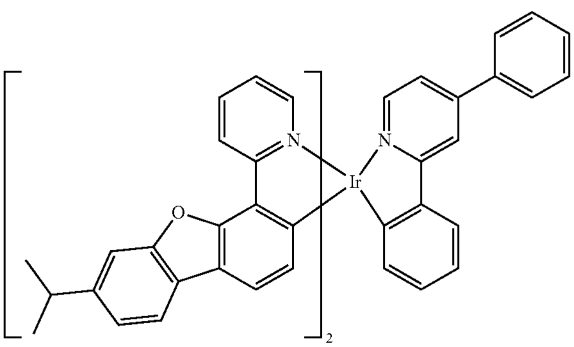
5
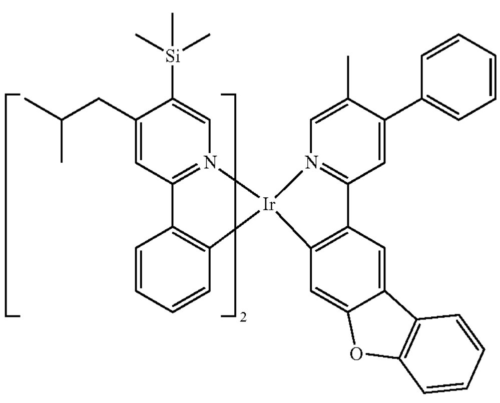
-continued
6
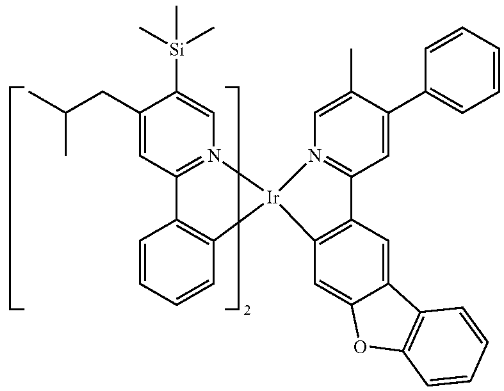
7
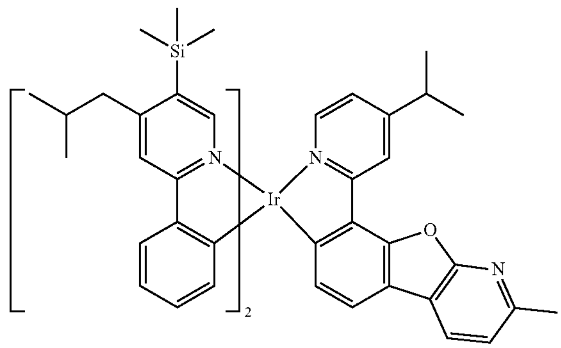
8
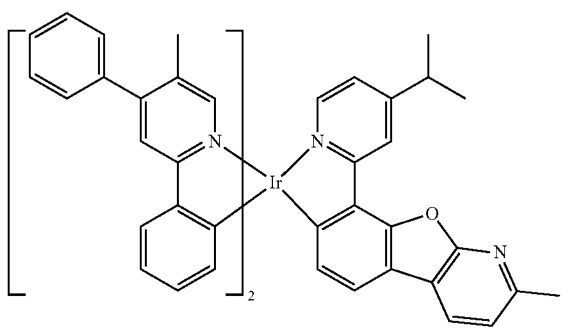
9
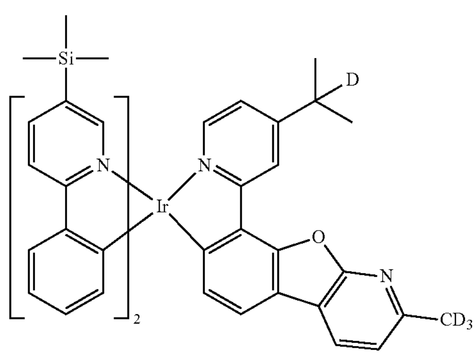

-continued
10
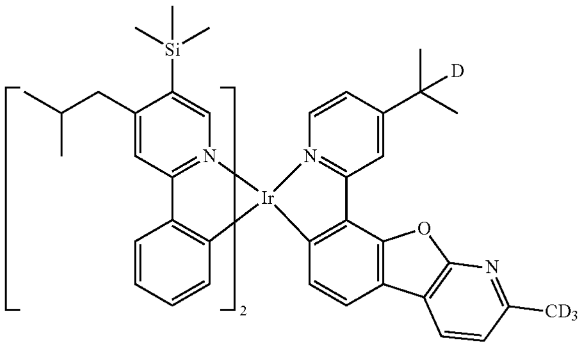
11
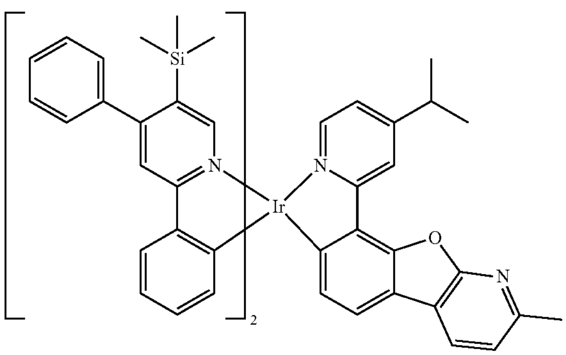
12
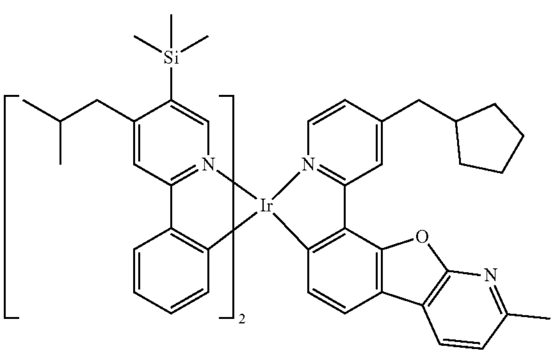
13
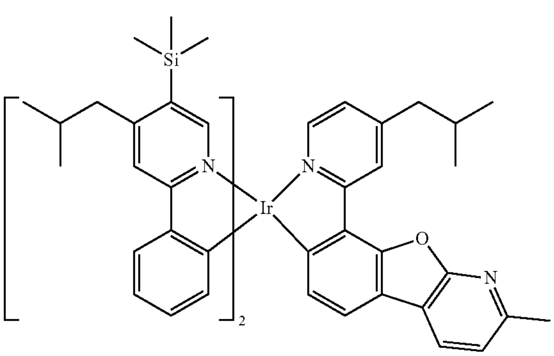
-continued
14
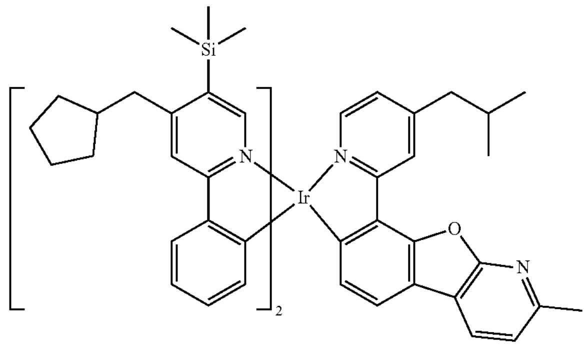
15
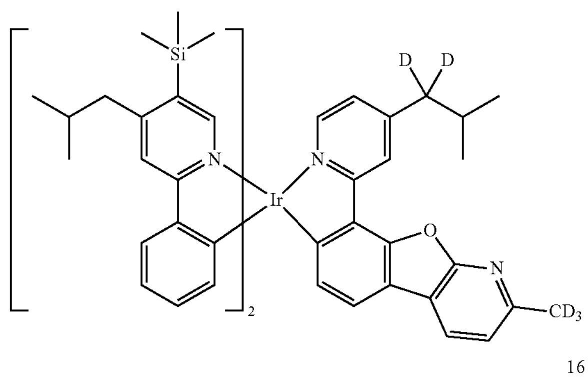
16
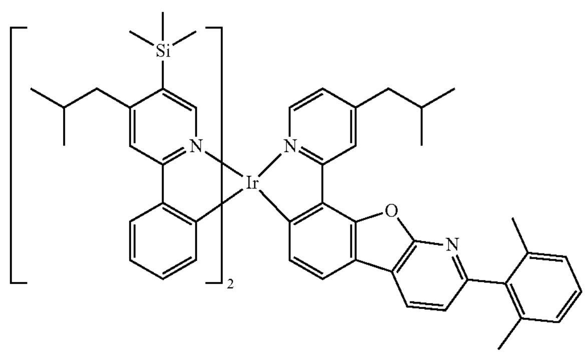
17
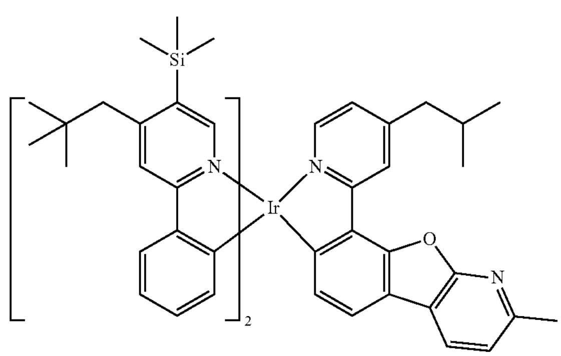

-continued
18
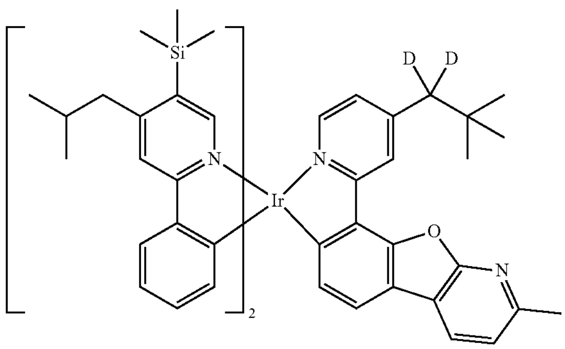
19
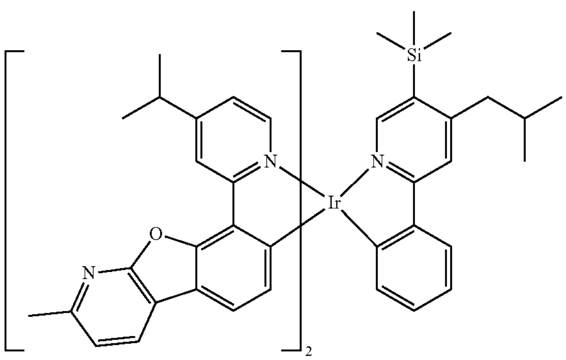
20
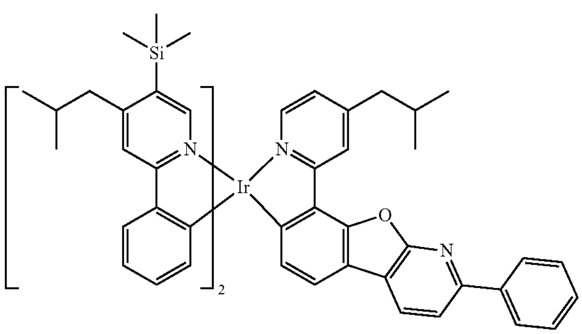
21
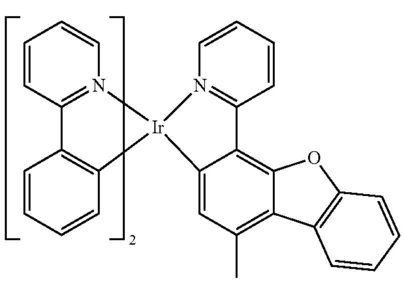
-continued
22
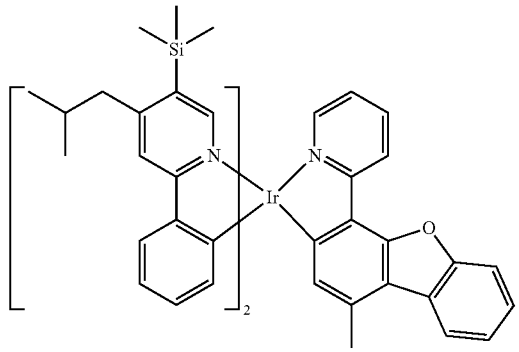
23
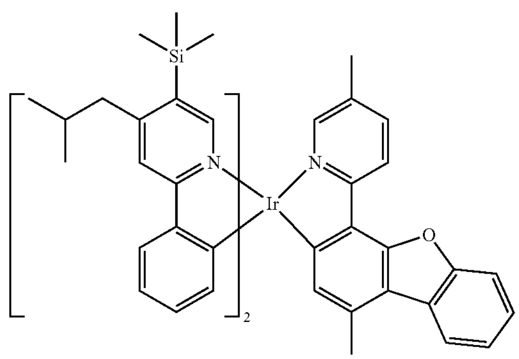
24
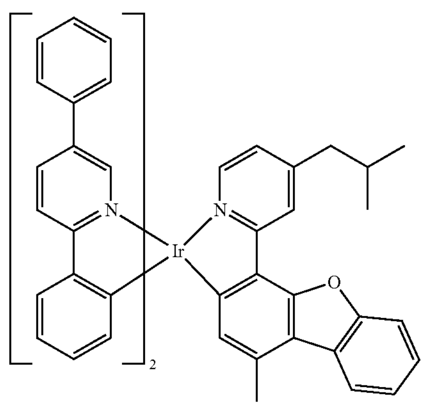
25
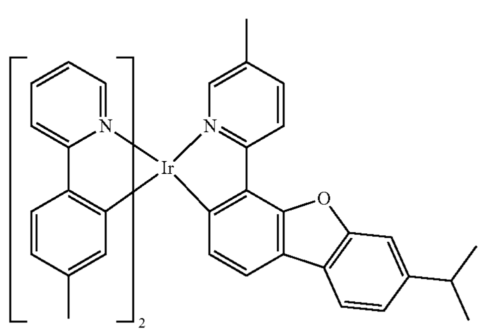

-continued
26
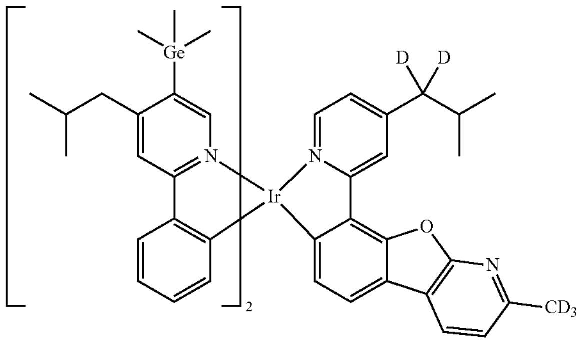
27
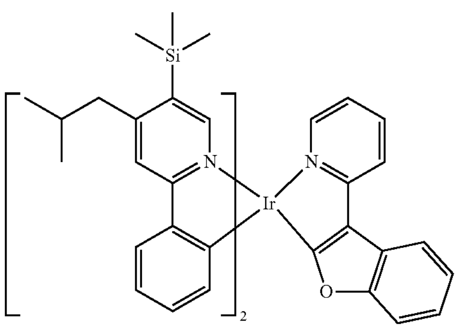
28
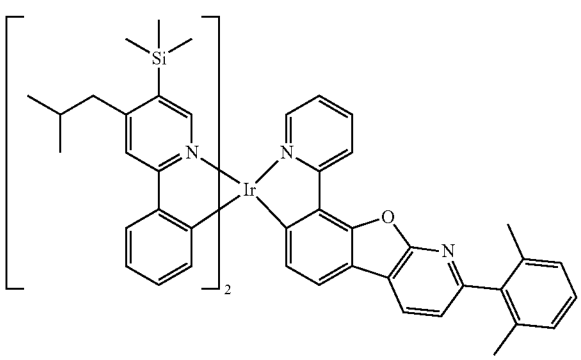
29
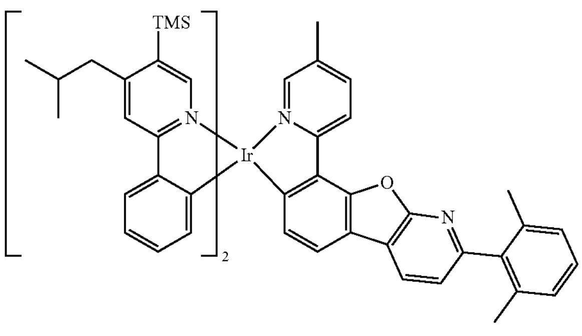
-continued
30
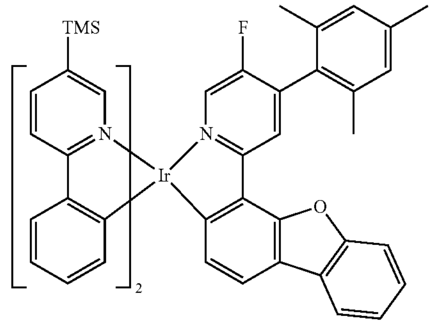
31
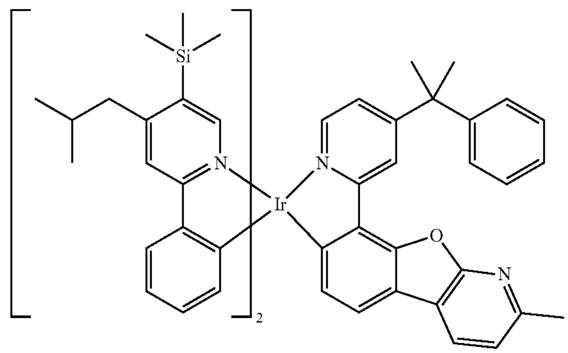
32
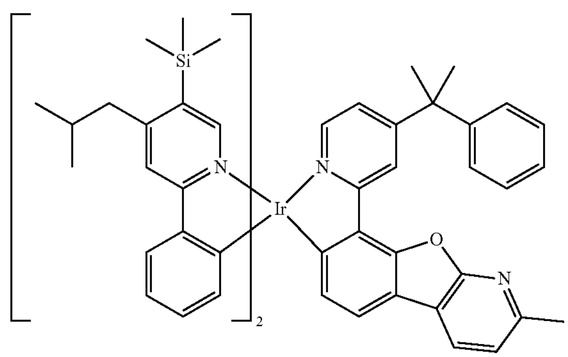
33
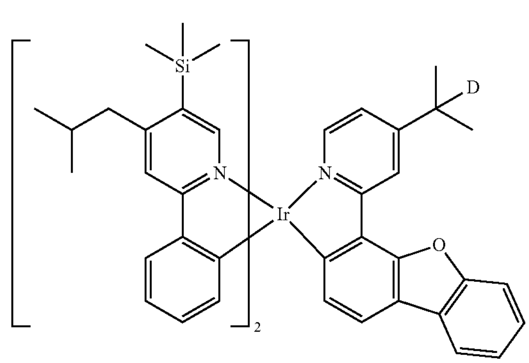

34
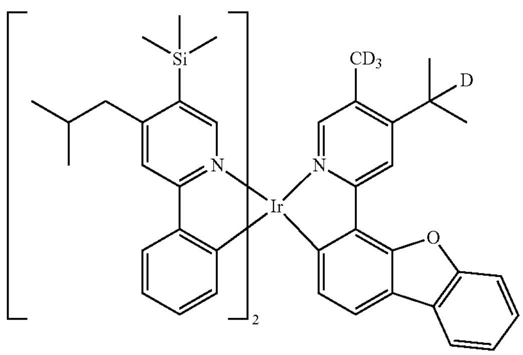
35
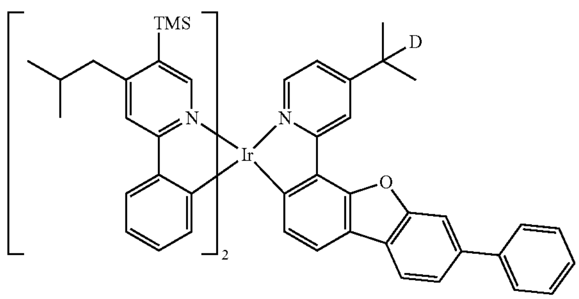
36
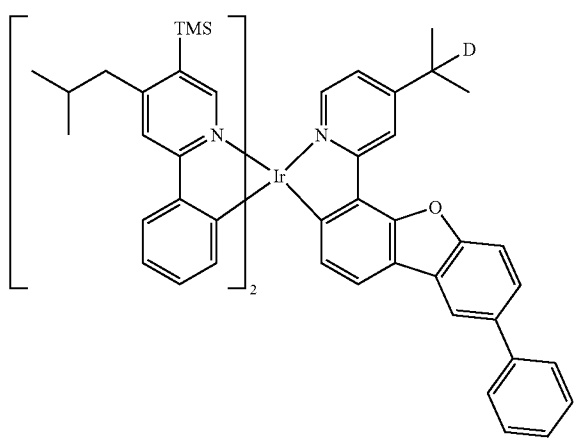
37
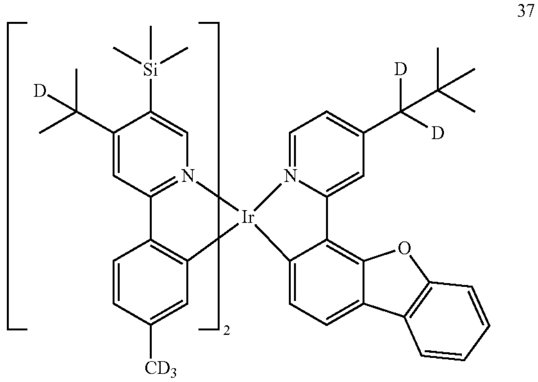
38
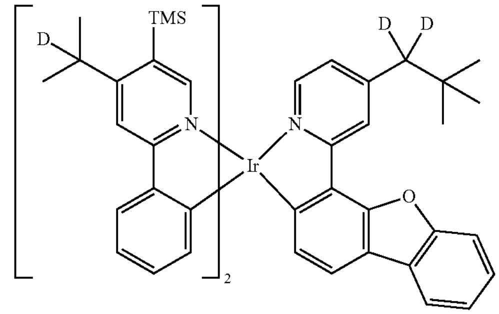
39
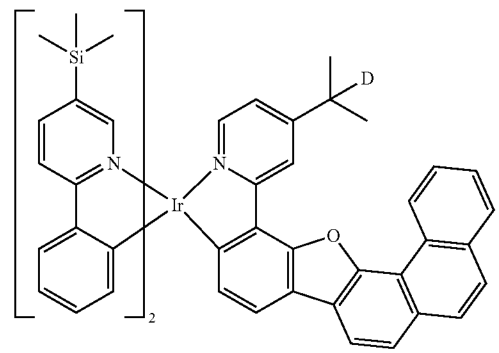
40
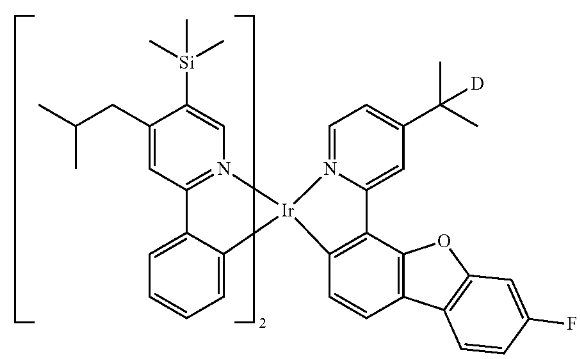
41
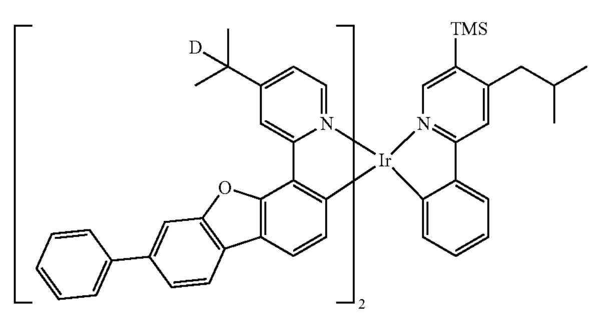

-continued
42
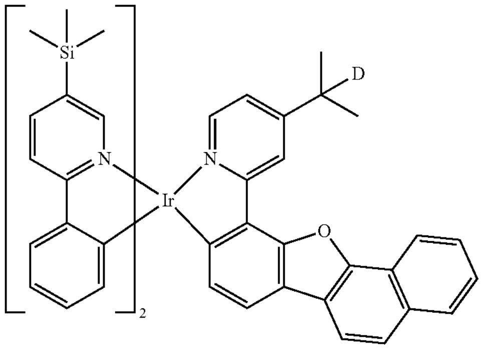
43
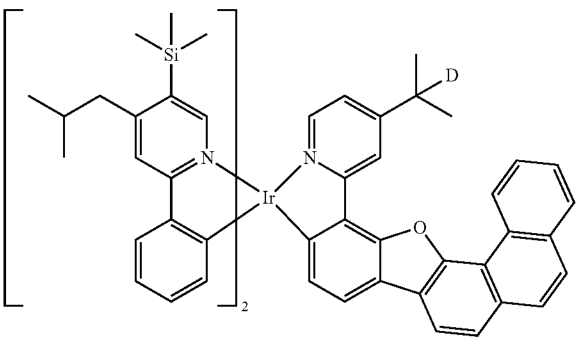
44
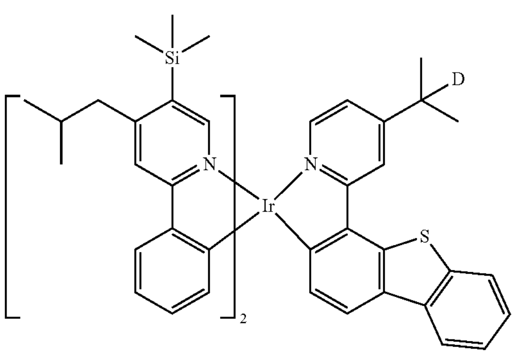
45
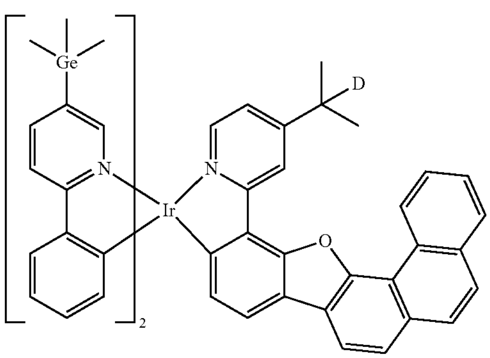
-continued
46
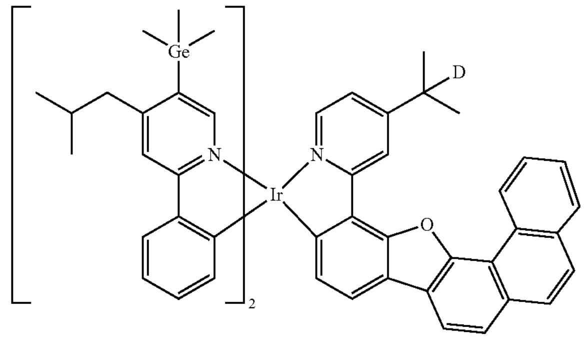
47
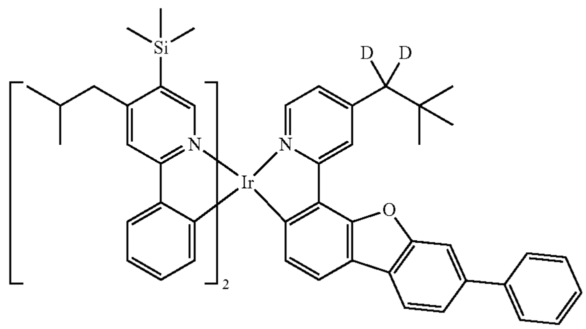
48
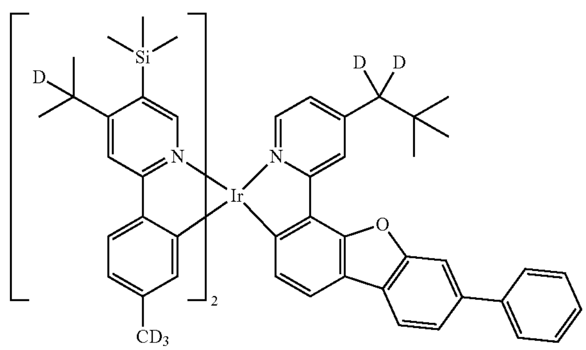
49
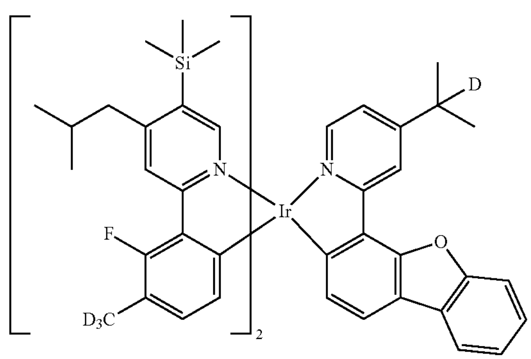

-continued
50
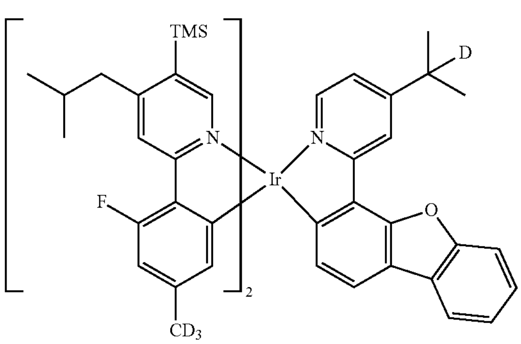
54
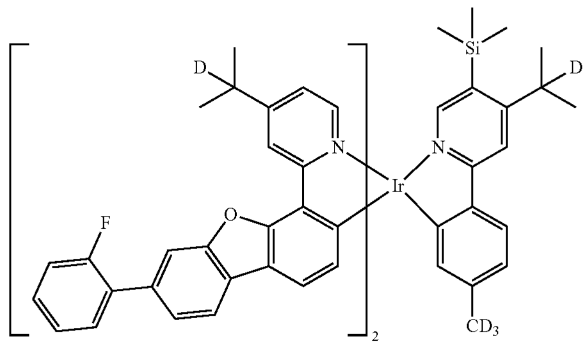
51
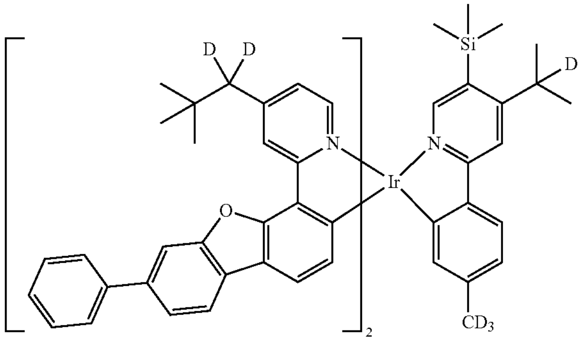
55
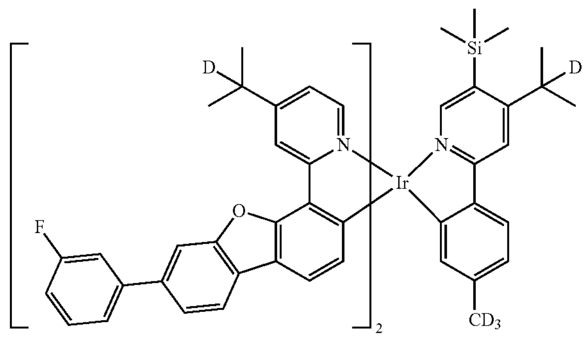
52
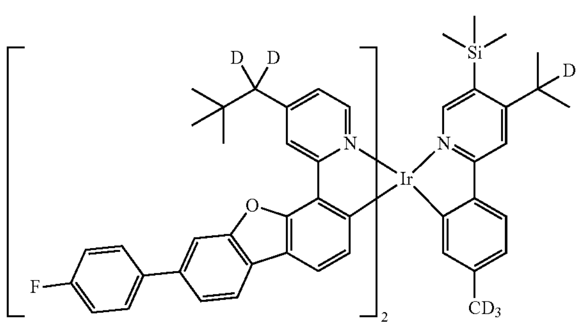
56
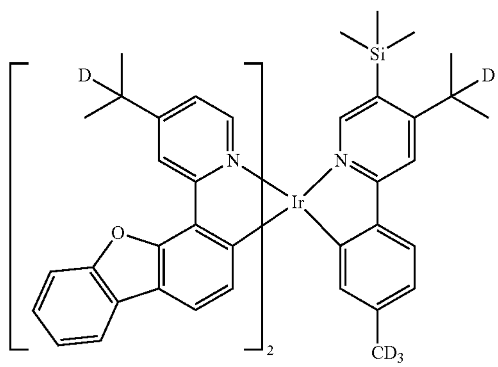
53
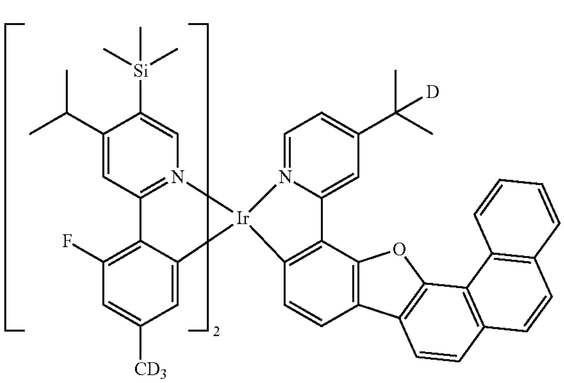
57
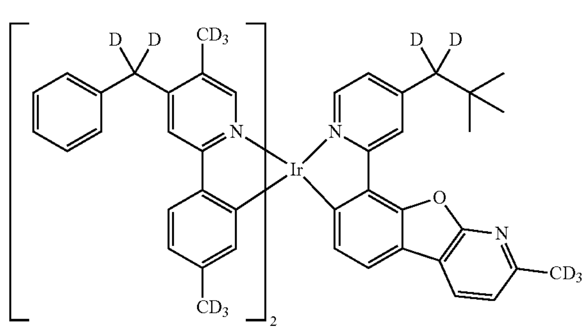

-continued
58
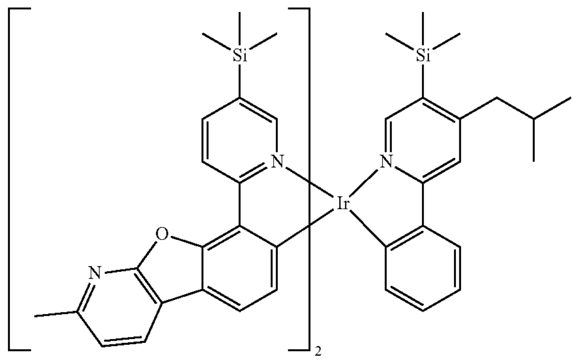
59
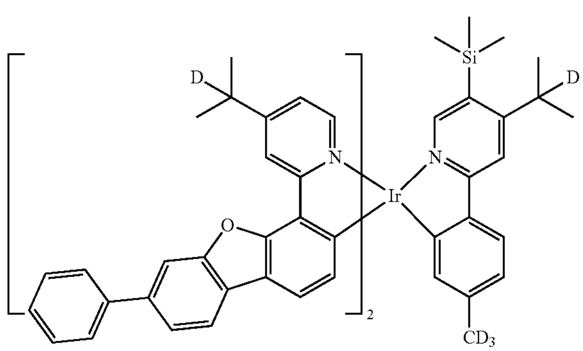
60
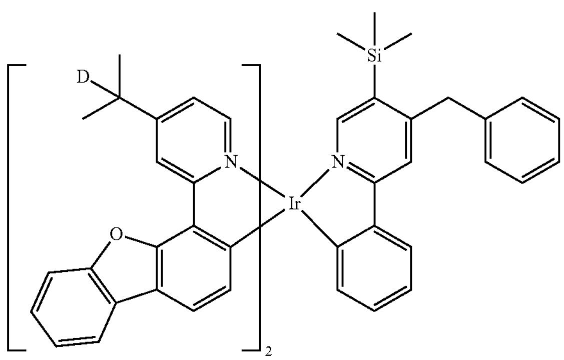
61
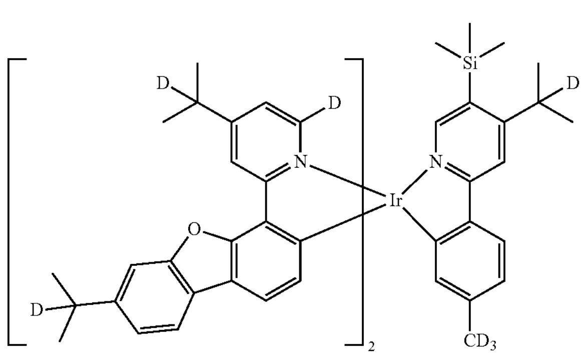
-continued
62
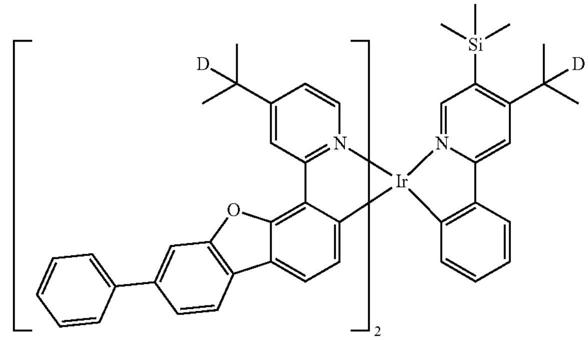
63
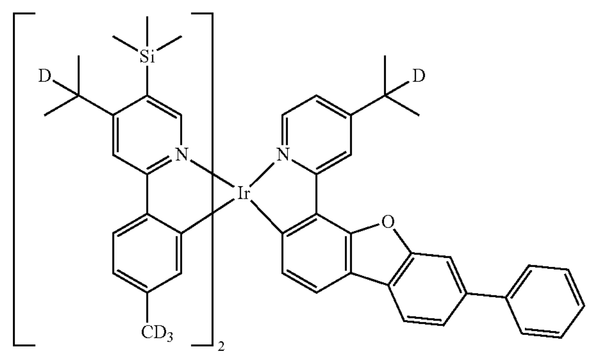
64
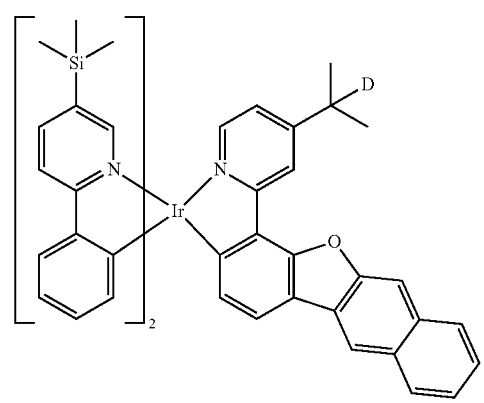
65
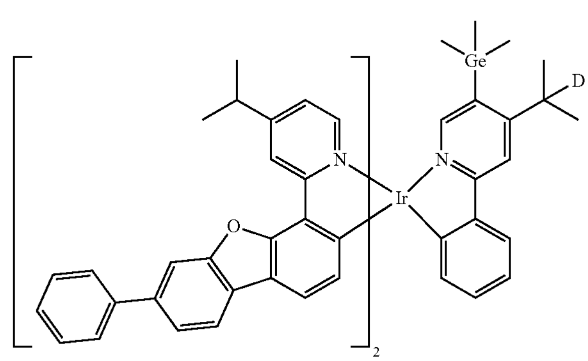

-continued
66
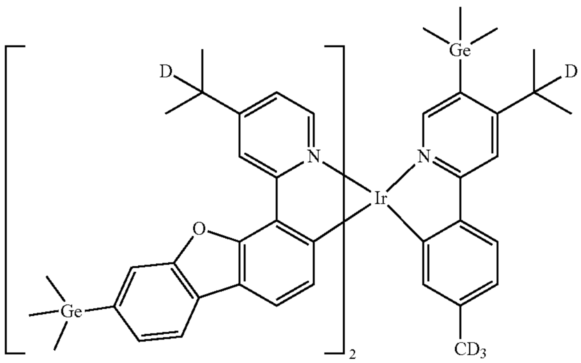
67
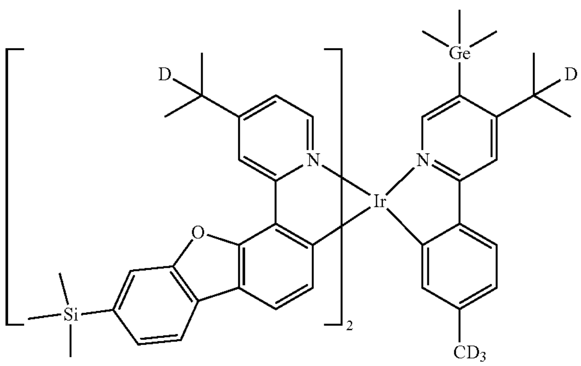
68
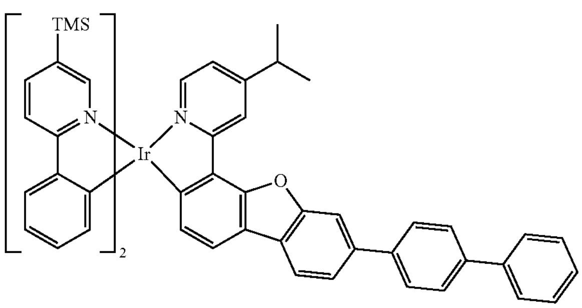
69
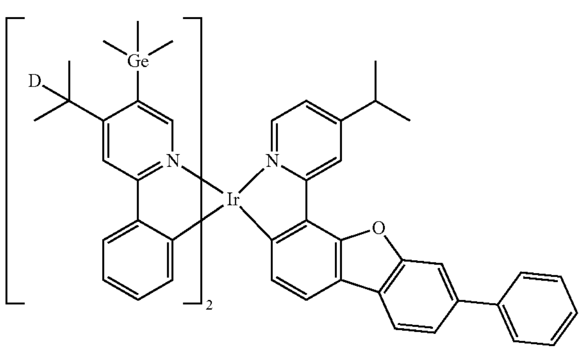
-continued
70
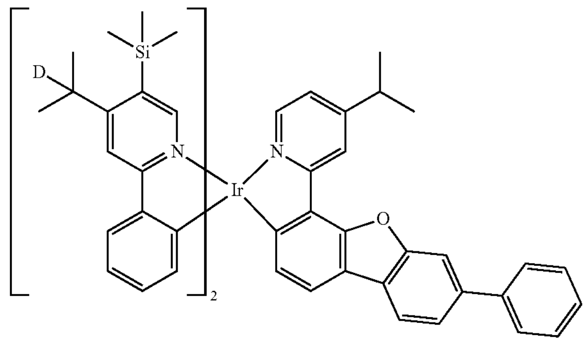
71
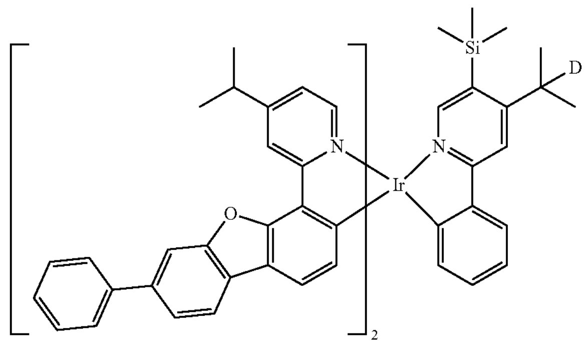
72
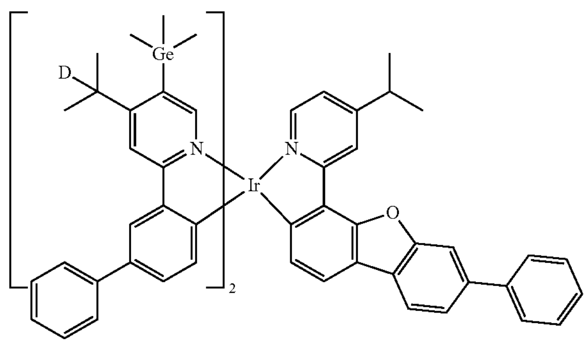
73
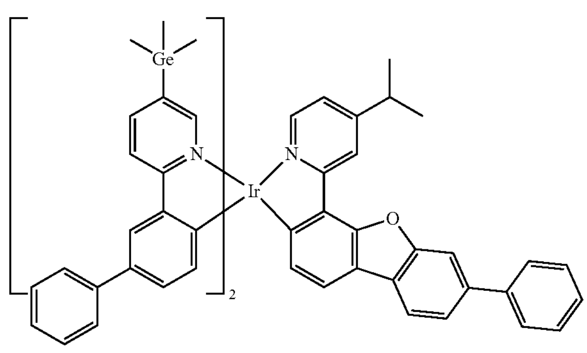

74
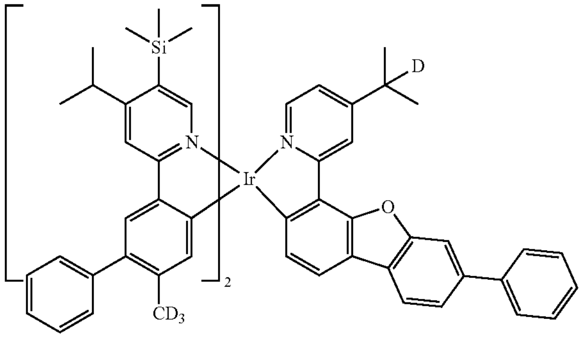
75
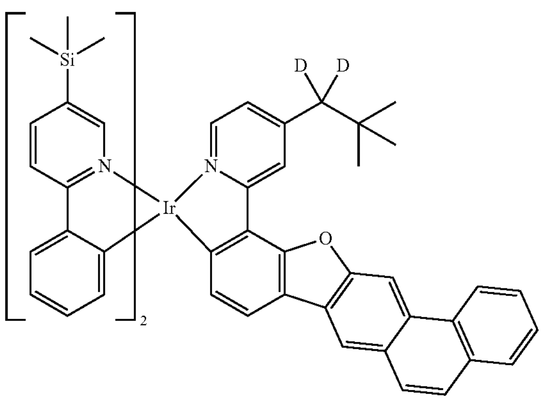
76
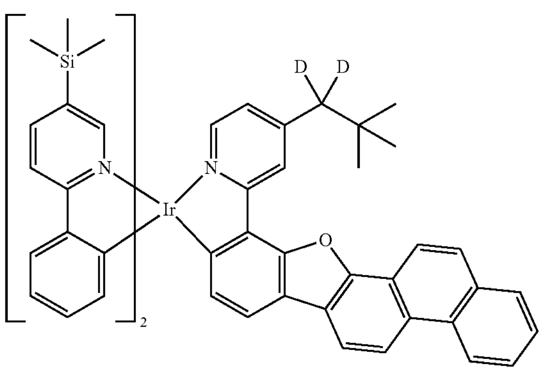
77
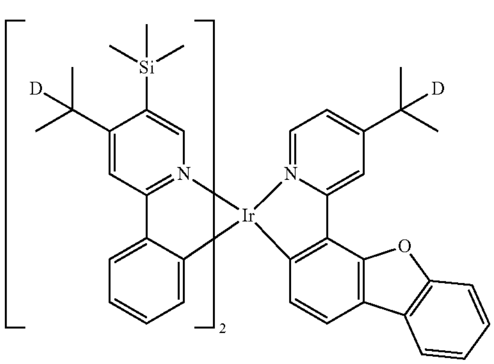
78
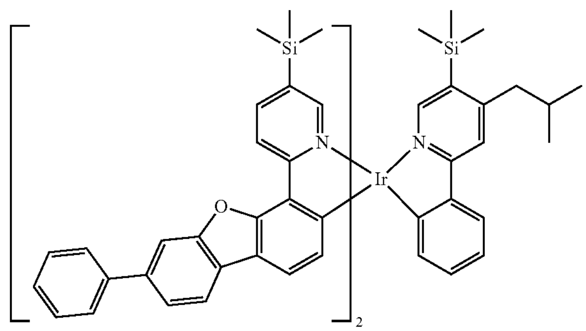
79
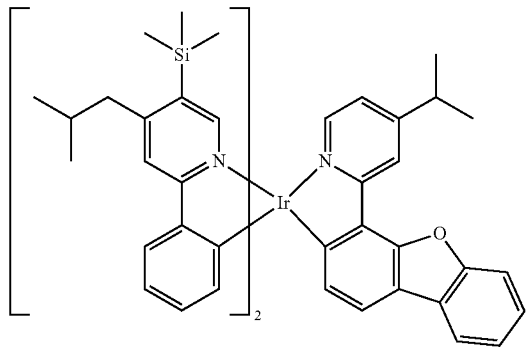
Group 1-4
1
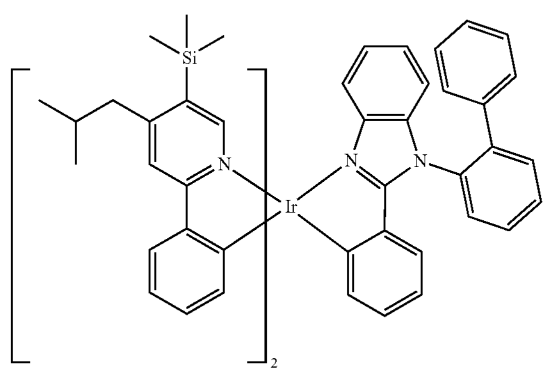
2
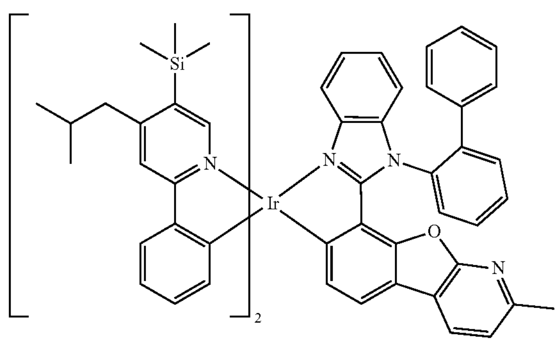

-continued
3
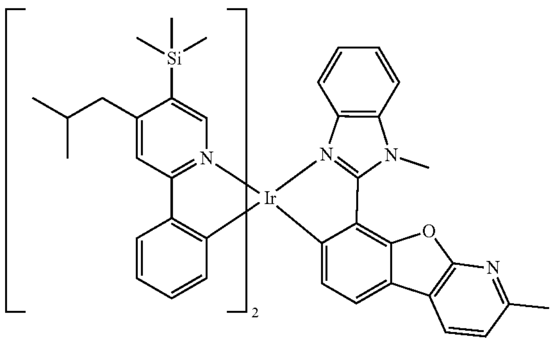
4
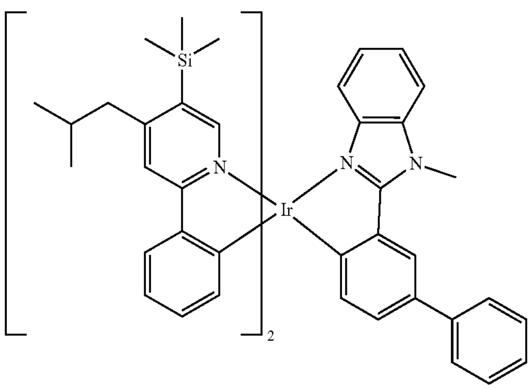
5
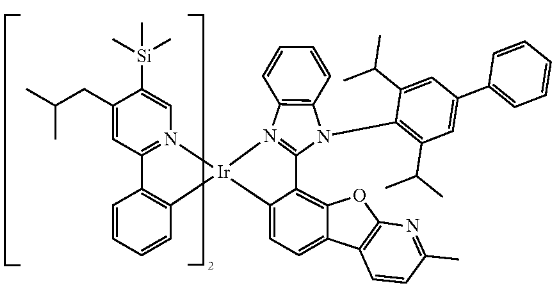
6
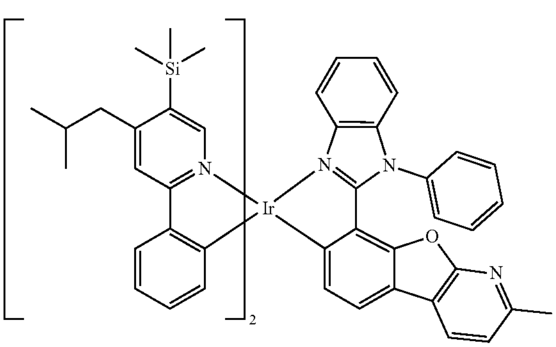
-continued
7
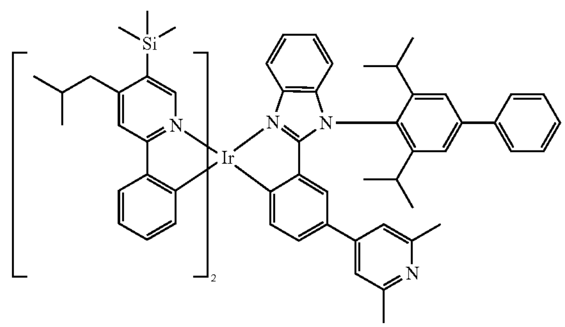
8
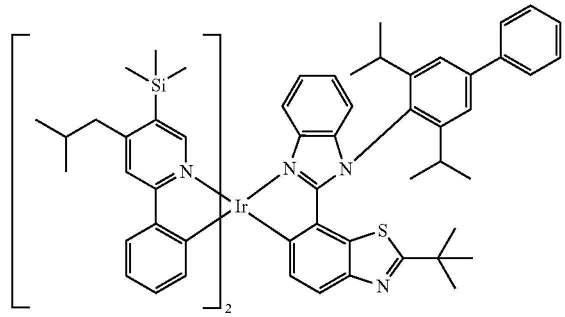
9
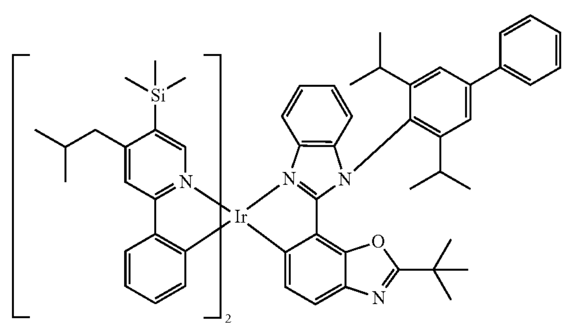
10
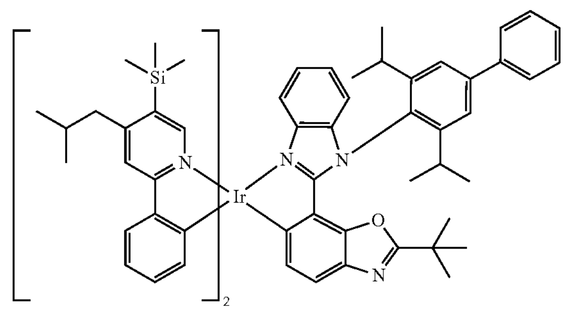

11
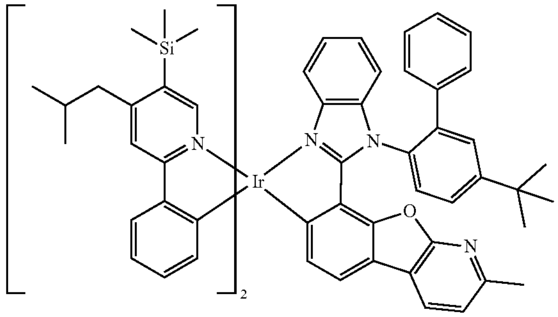
12
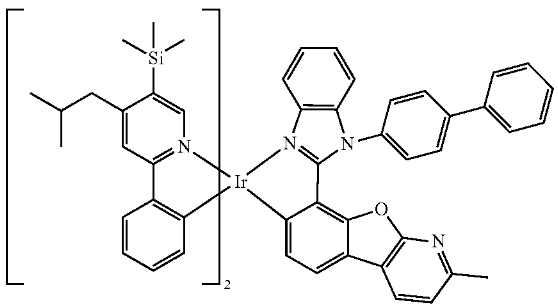
13
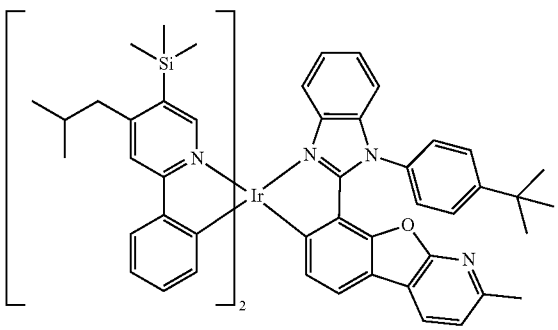
14
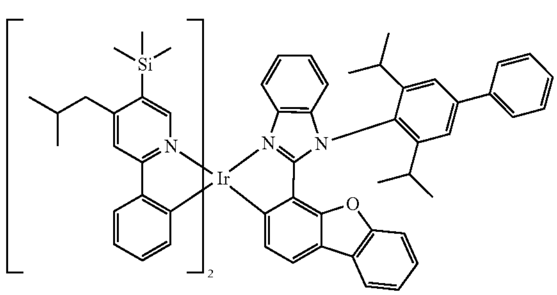
15
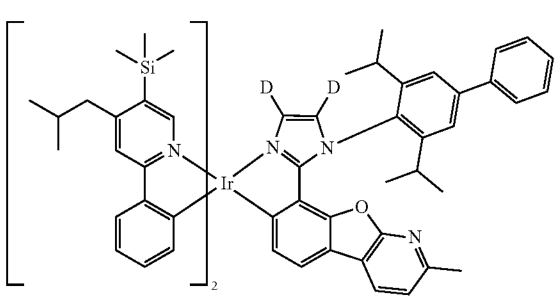
16
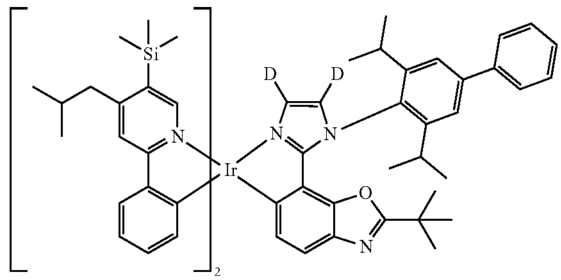
17
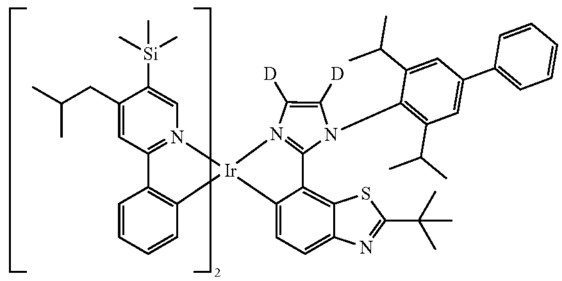
18
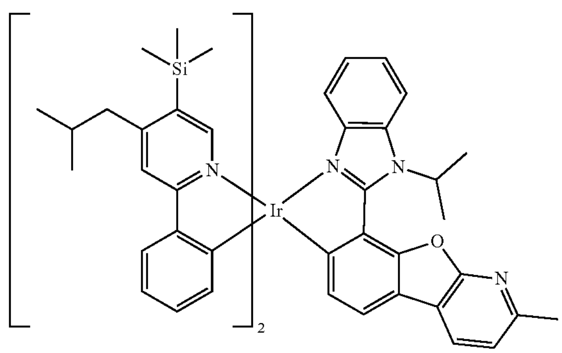
19
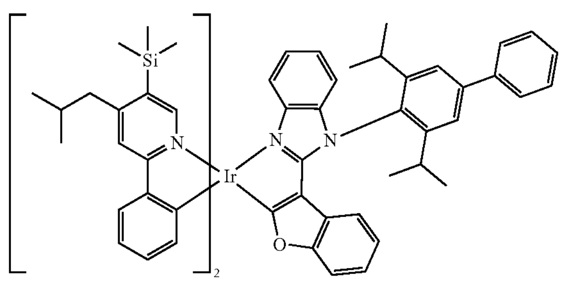
20
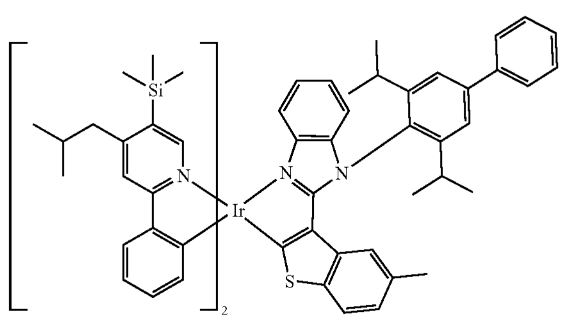

-continued
21
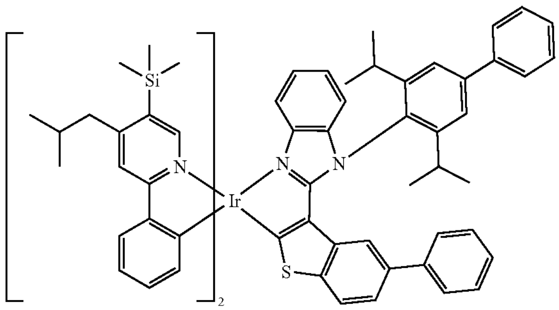
22
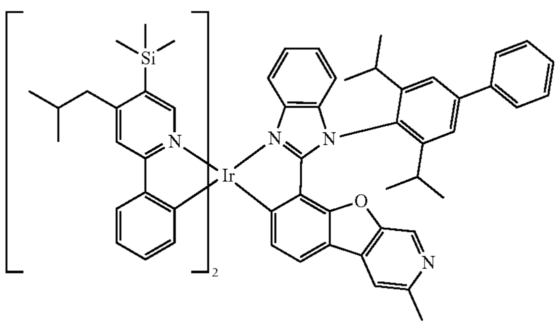
23
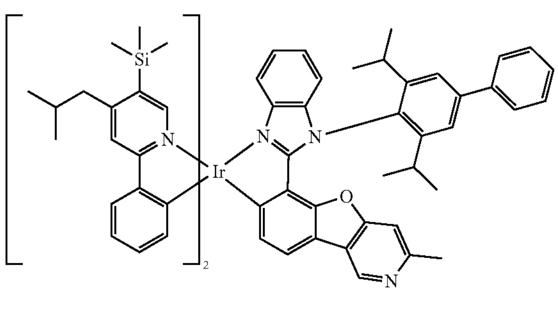
24
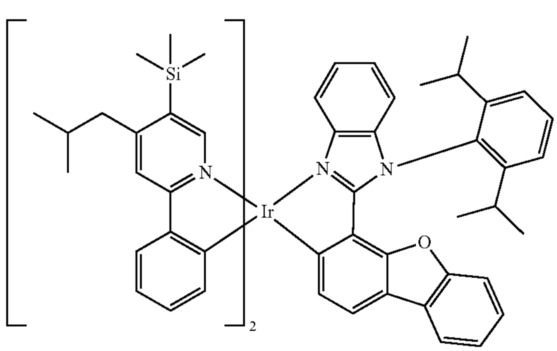
-continued
25
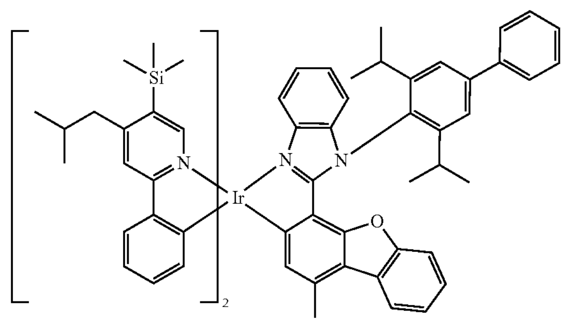
26
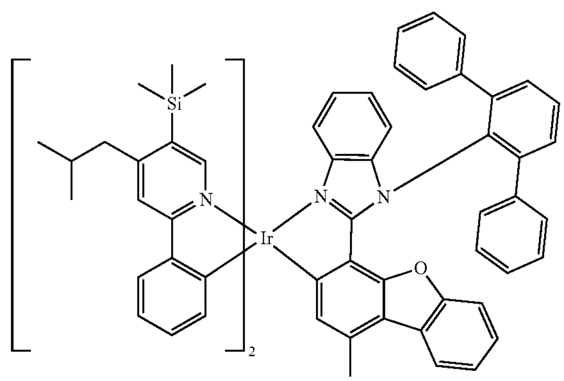
27
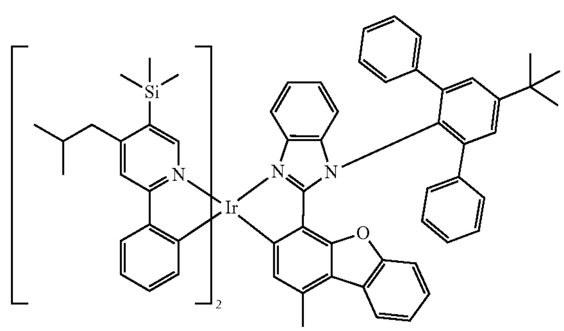
28
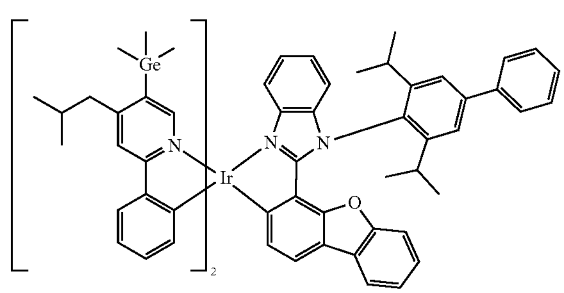

-continued
29
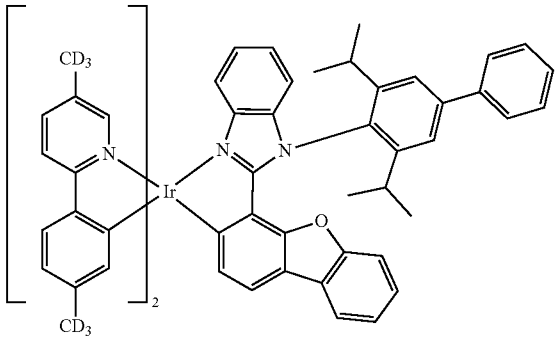
30
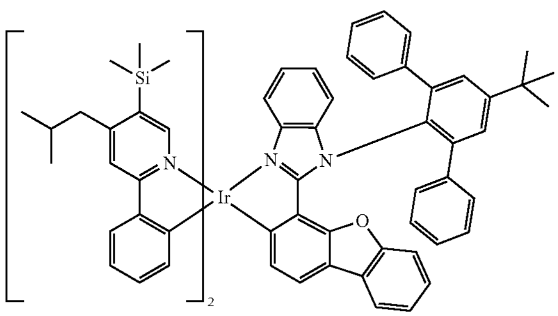
31
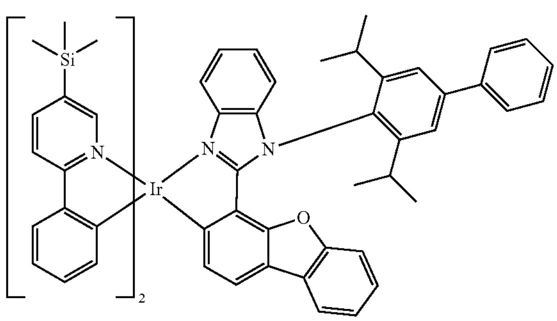
32
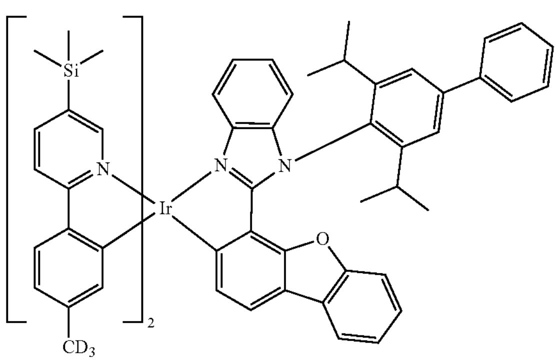
-continued
33
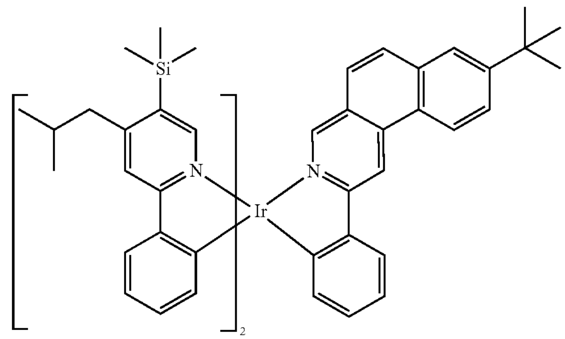
34
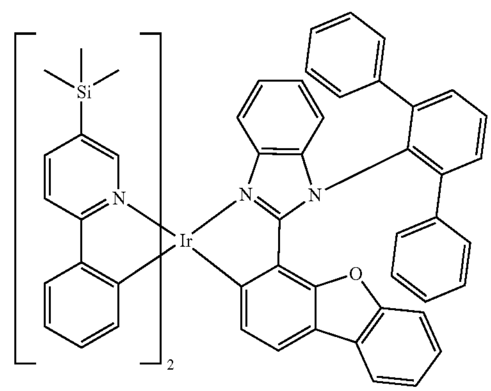
35
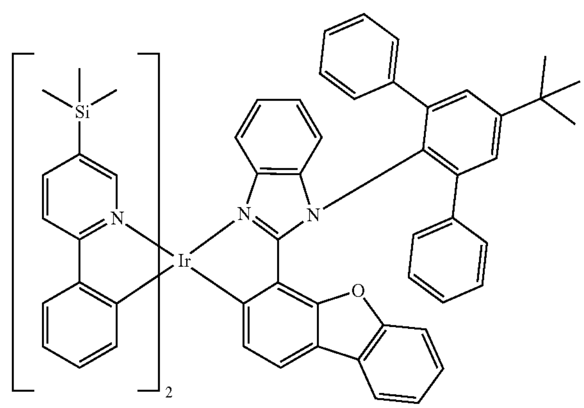
36
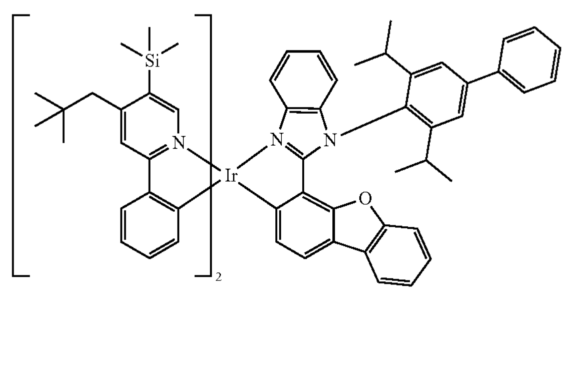

37
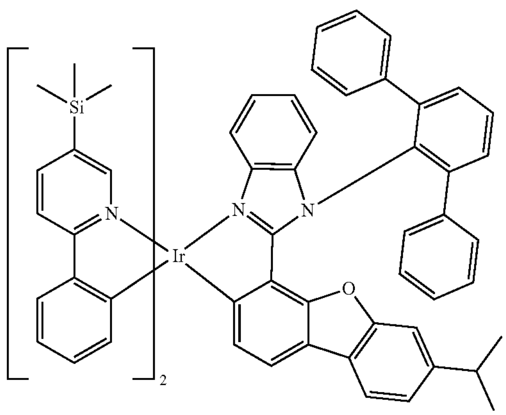
38
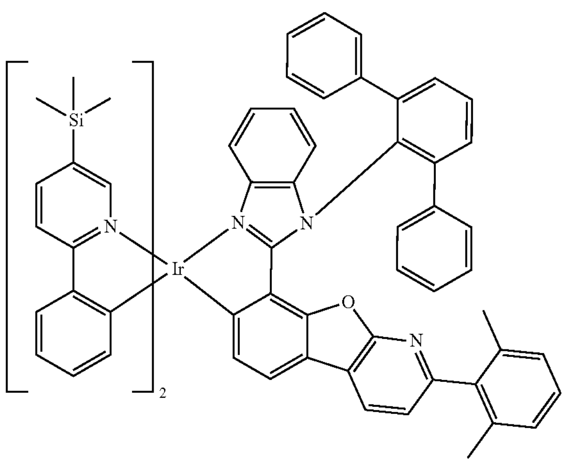
39
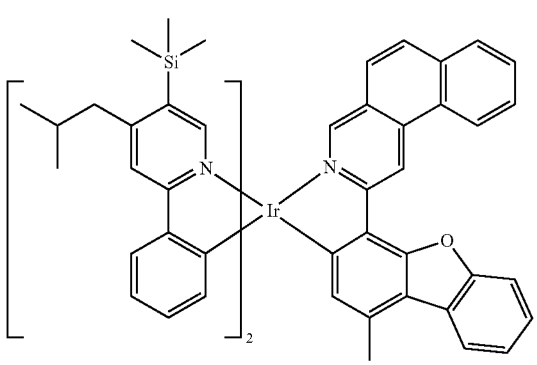
40
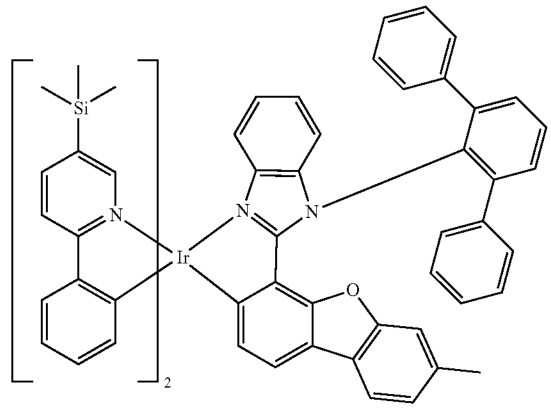
41
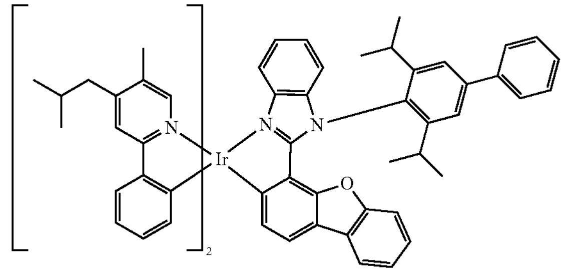
42
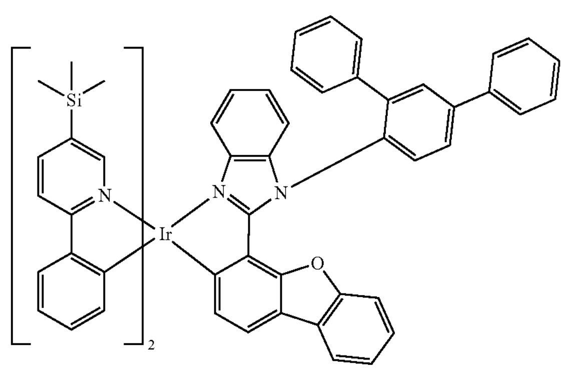
43
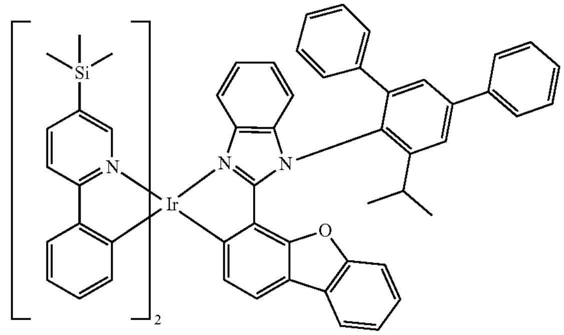

44
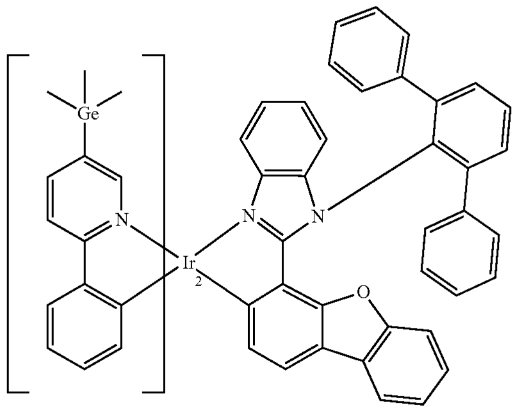
45
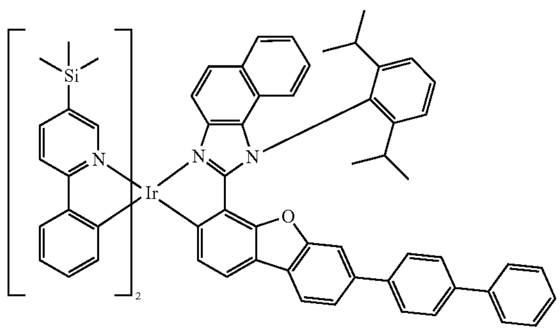
46
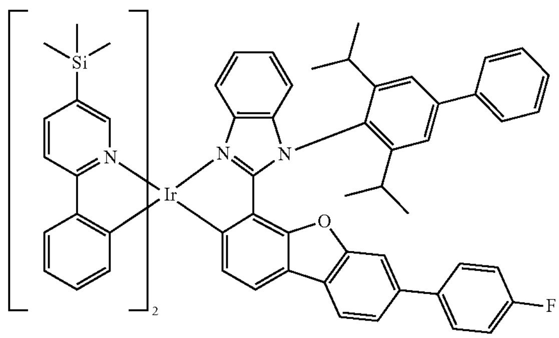
47
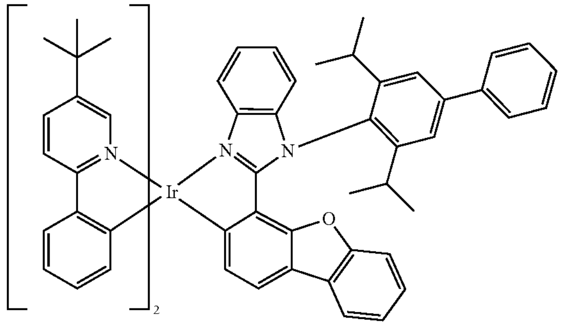
48
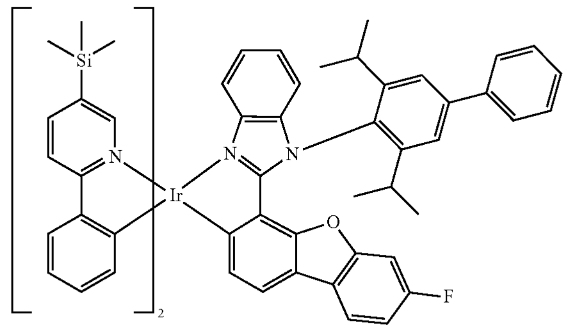
49
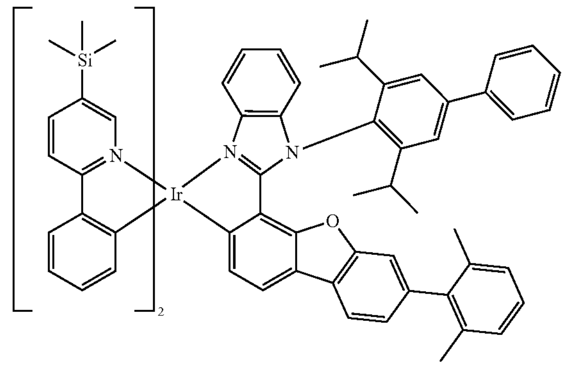
50
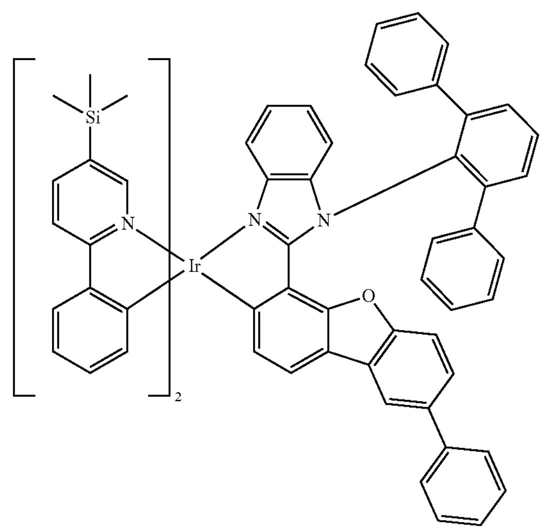
51
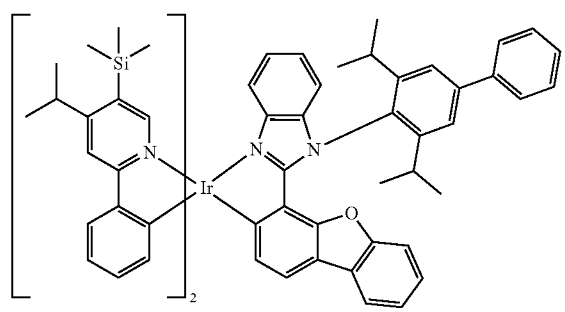

52
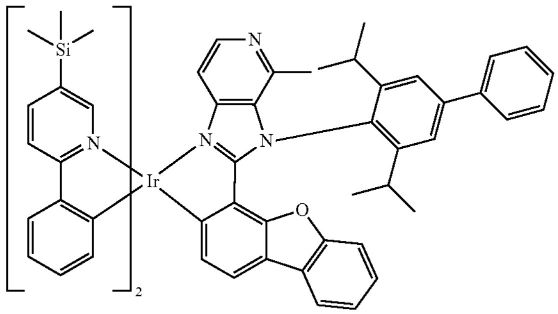
53
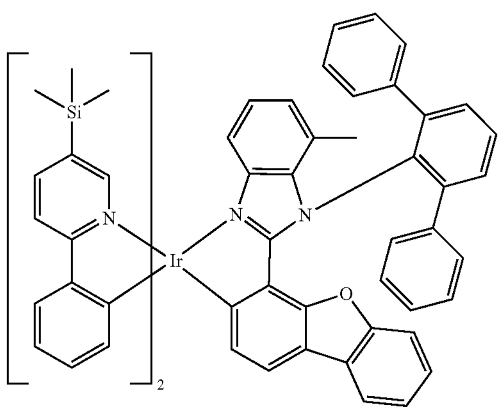
54
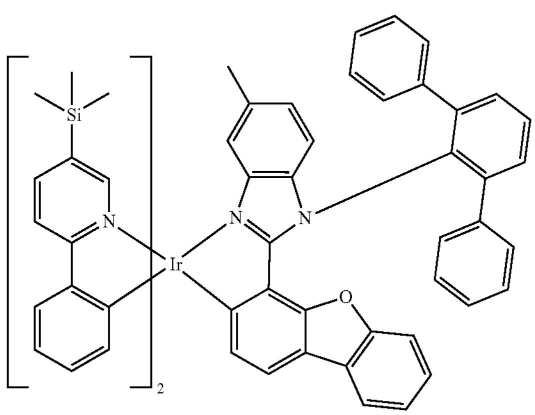
55
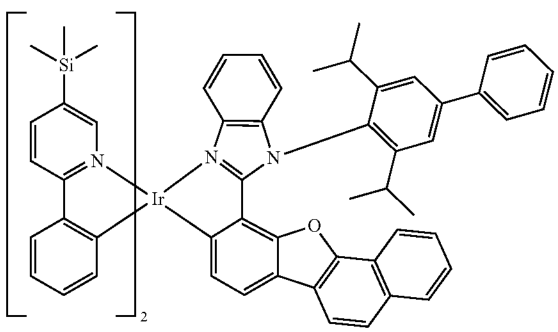
56
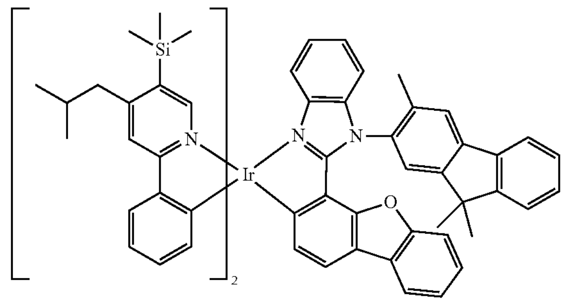
57
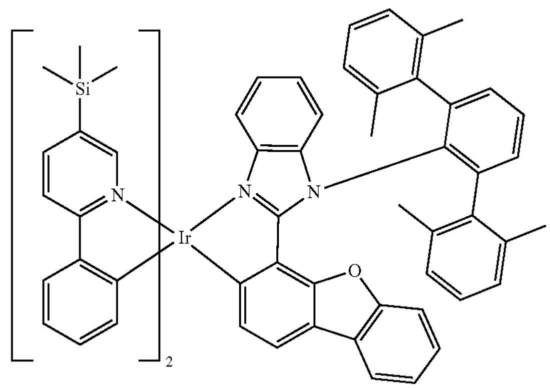
58
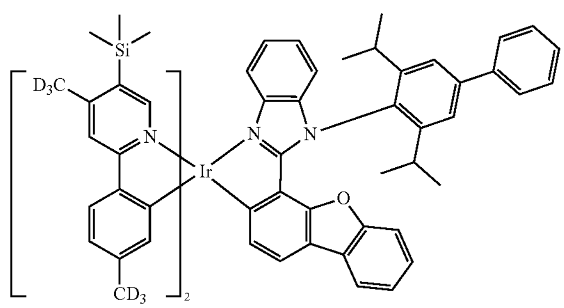
59
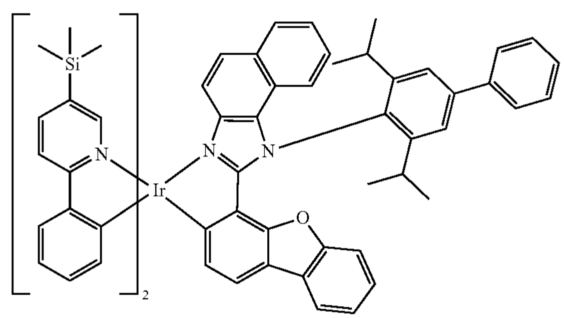

-continued
60
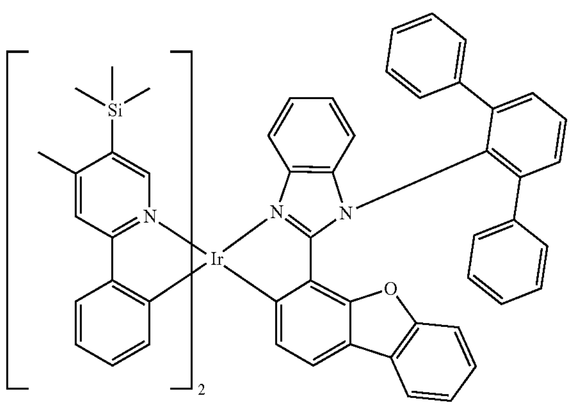
61
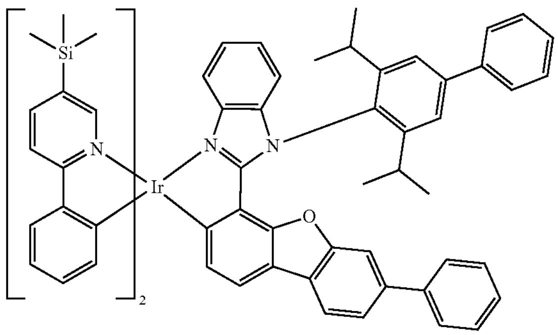
62
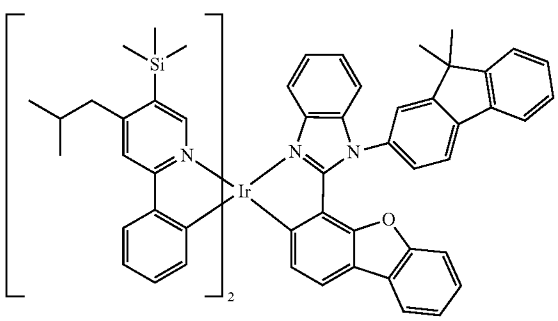
63
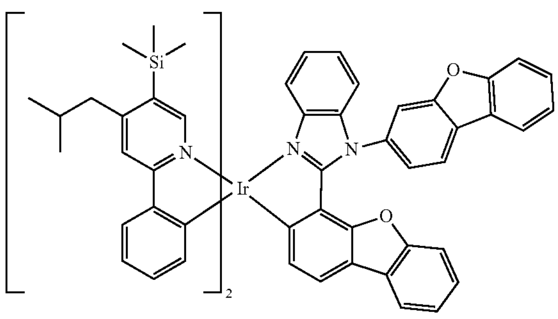
-continued
64
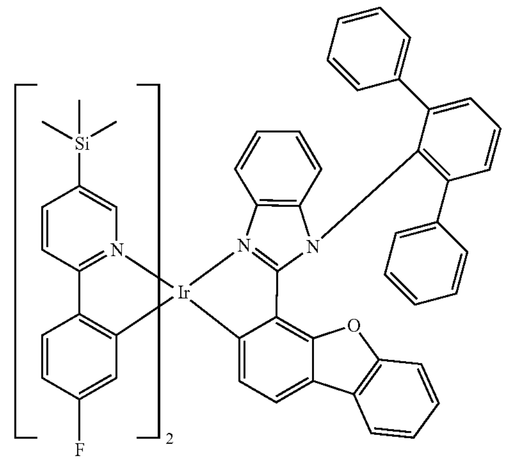
65
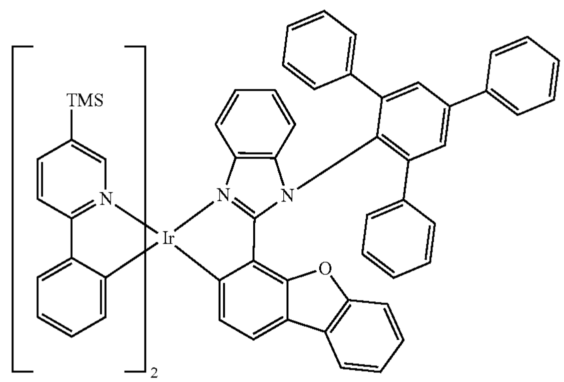
66
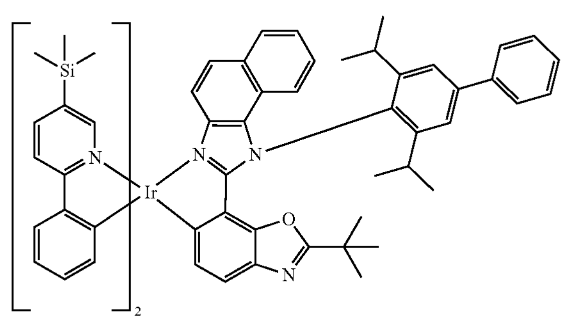
67
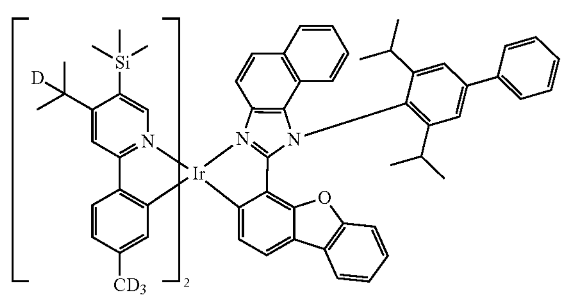

-continued
68
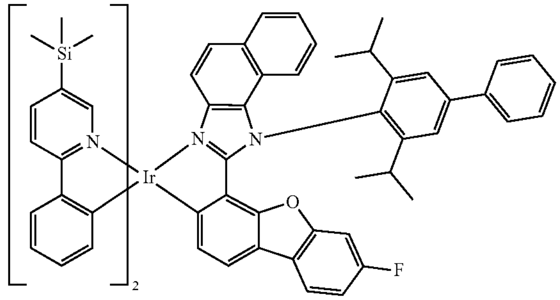
69
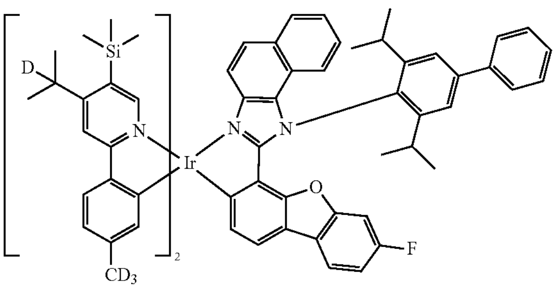
70
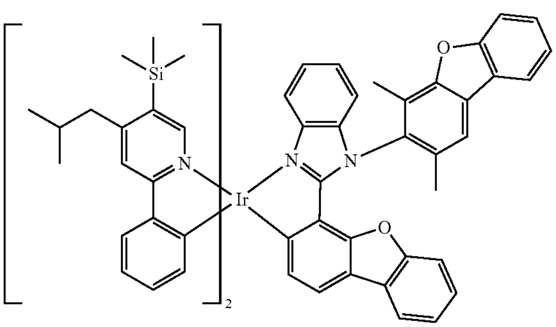
71
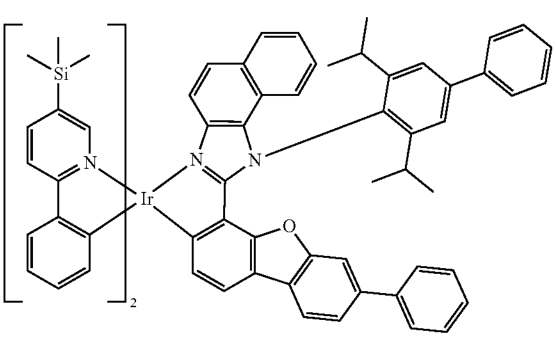
-continued
72
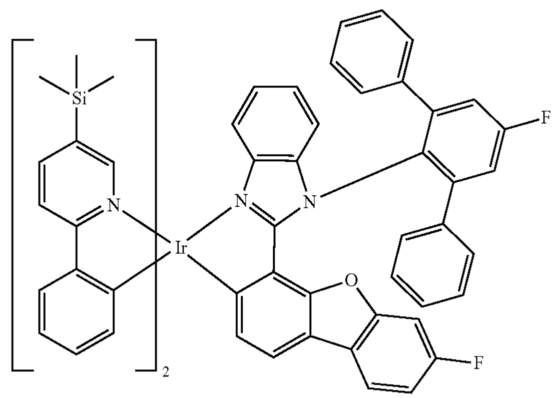
73
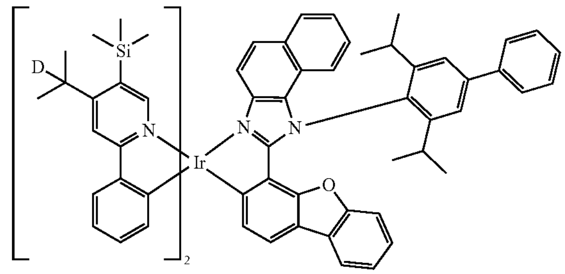
74
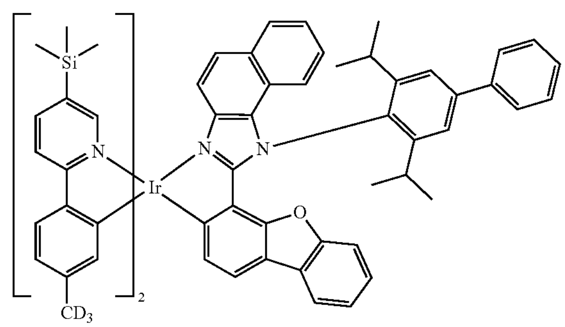
75
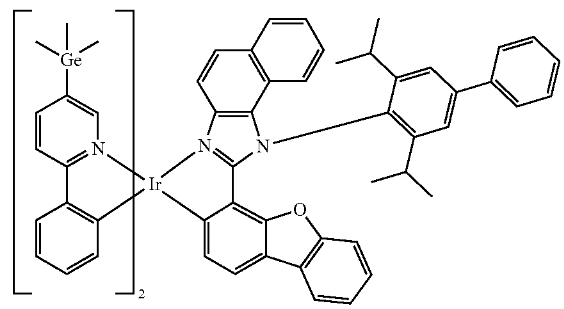

-continued
76
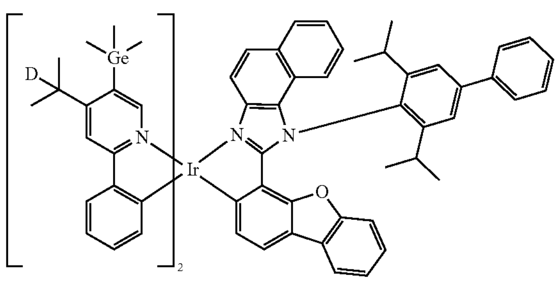
77
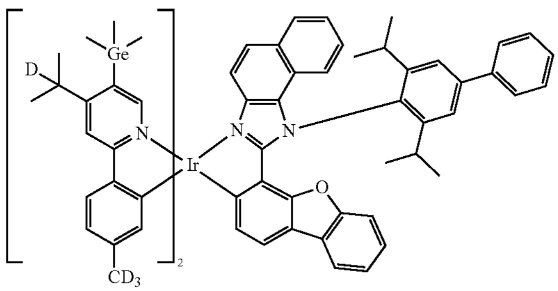
78
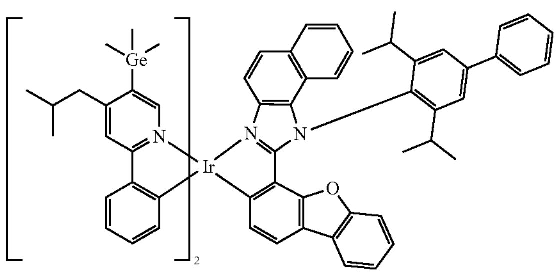
79
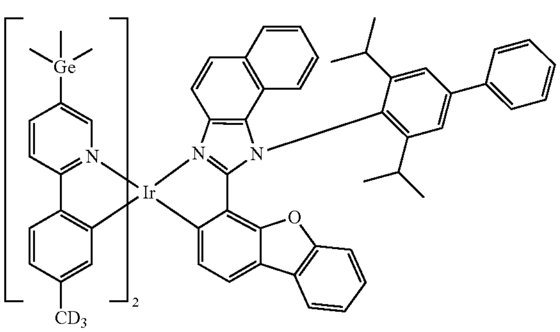
80
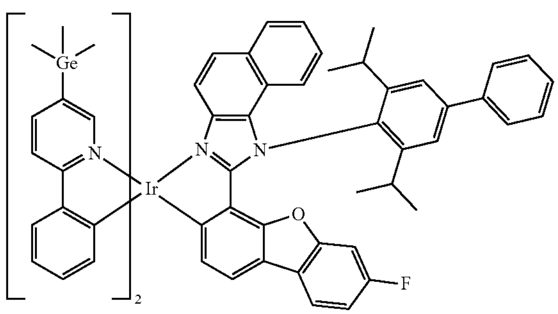
-continued
81
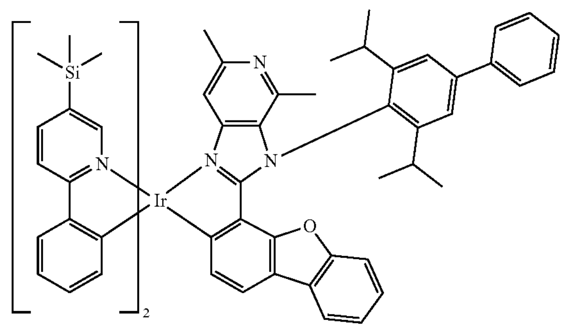
82
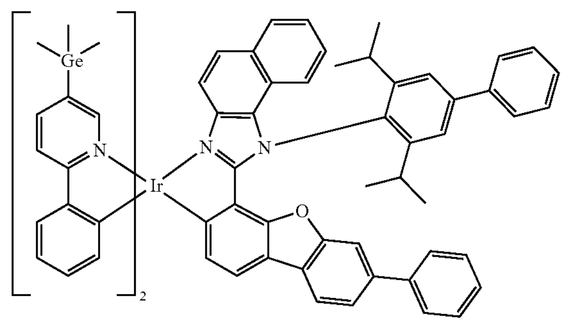
83
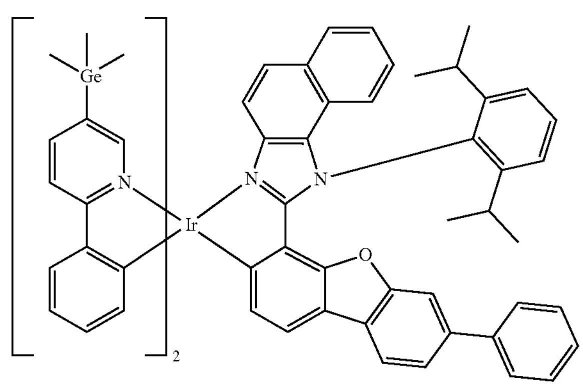
84
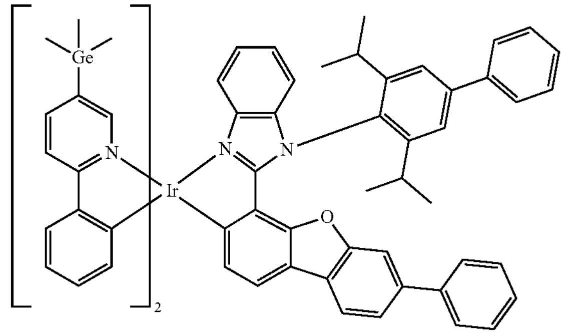

85
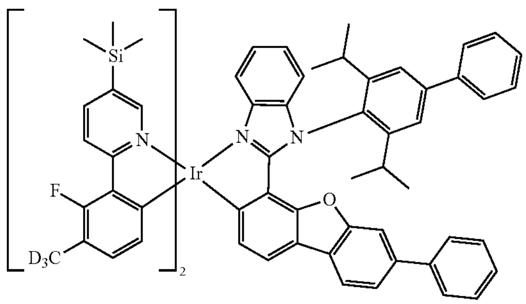
86
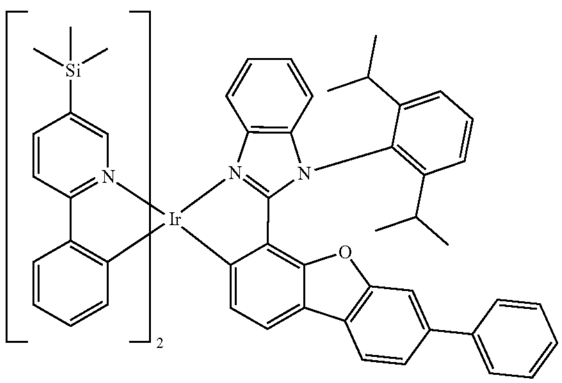
87
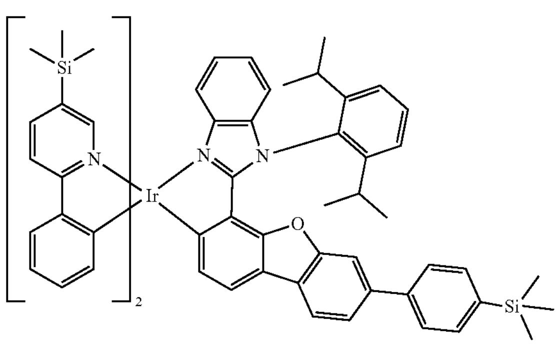
88
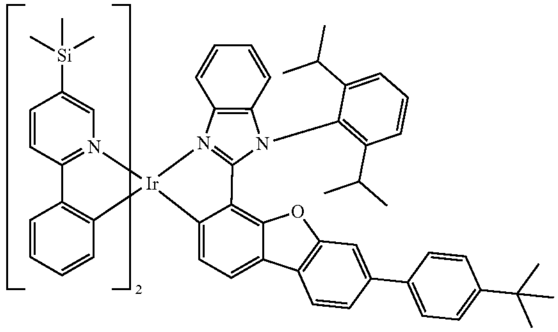
89
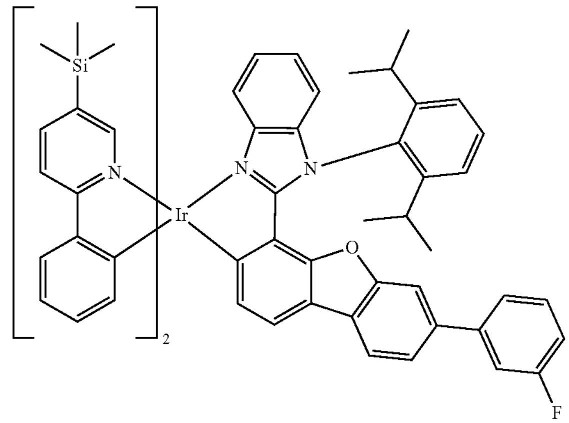
90
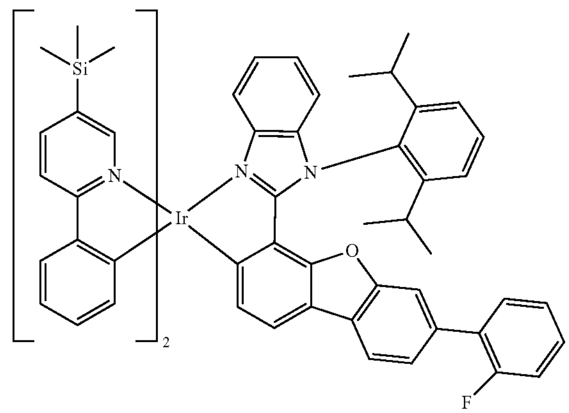
91
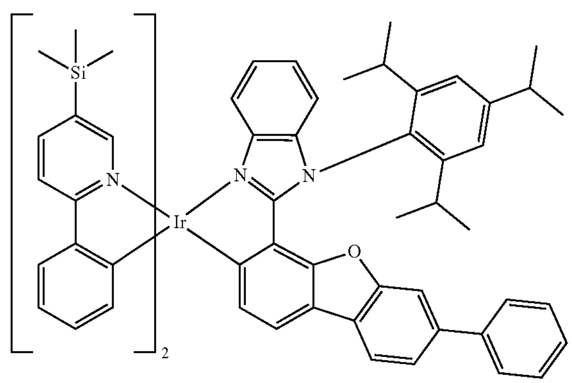
92
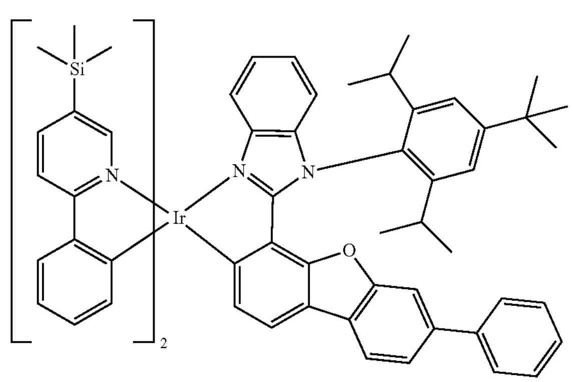

-continued
93
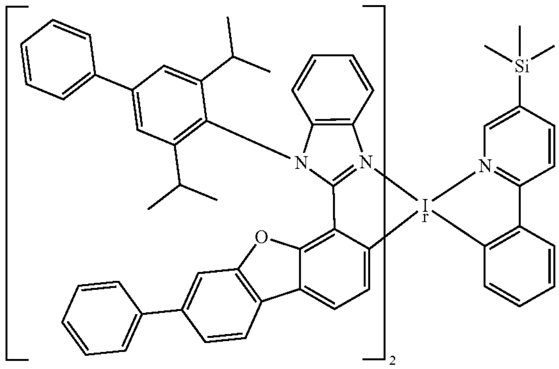
94
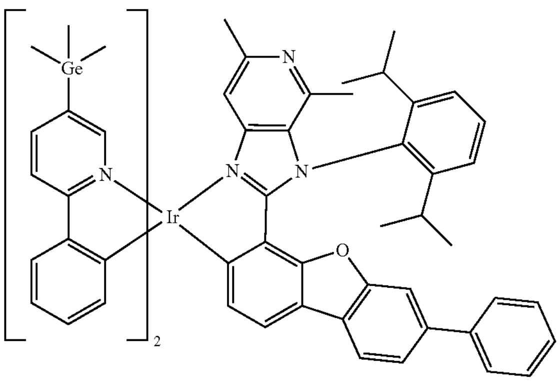
95
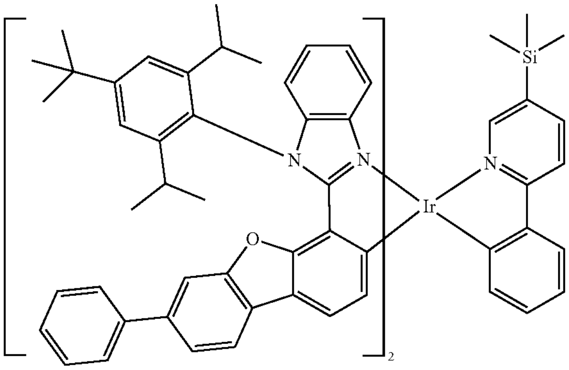
96
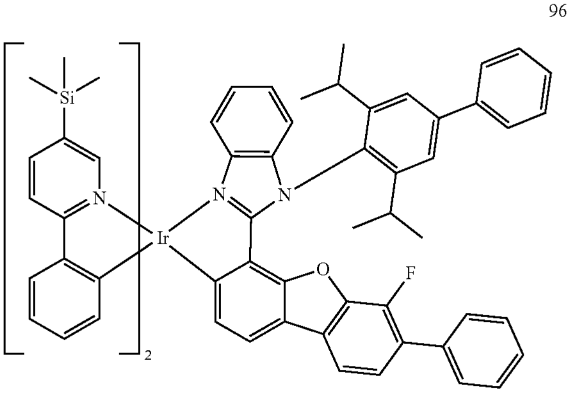
-continued
97
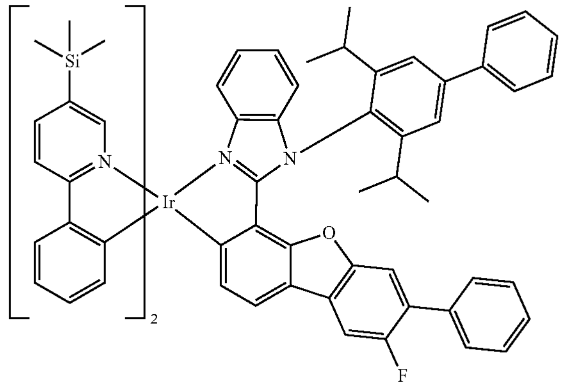
98
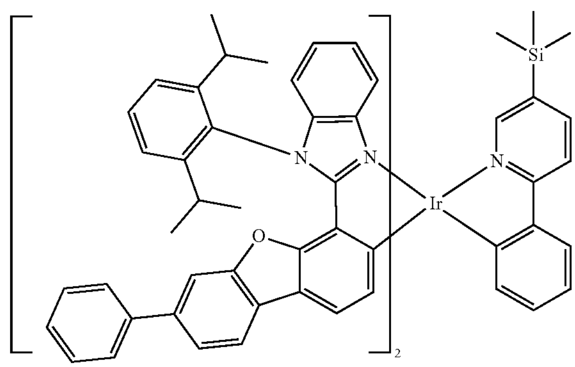
99
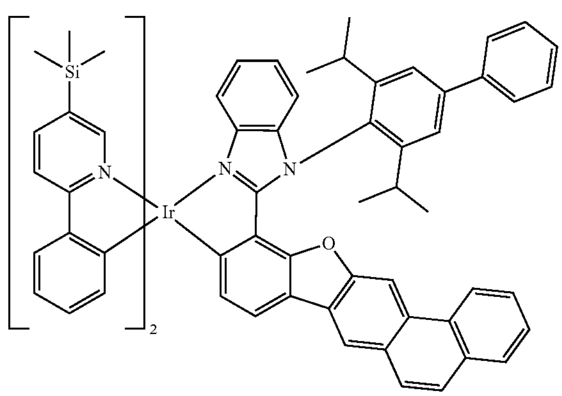

-continued
100
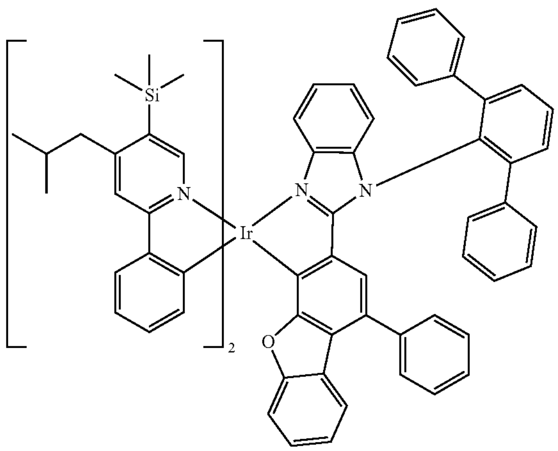
101
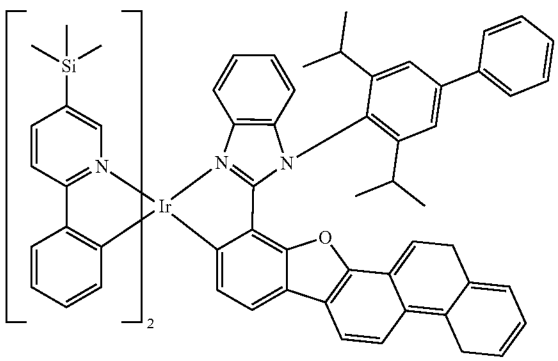
102
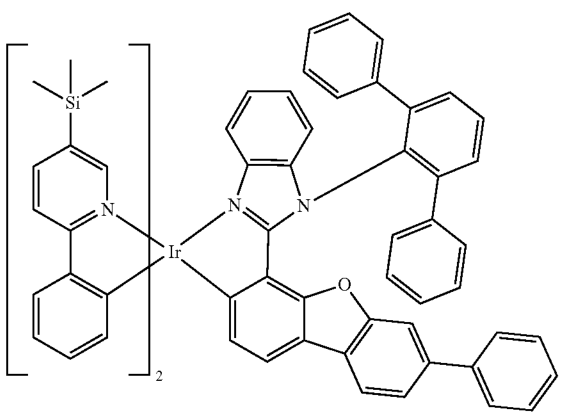
103
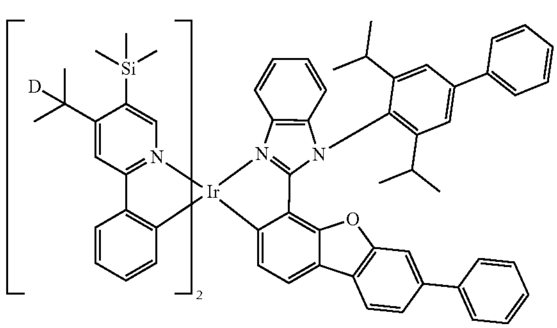
-continued
104
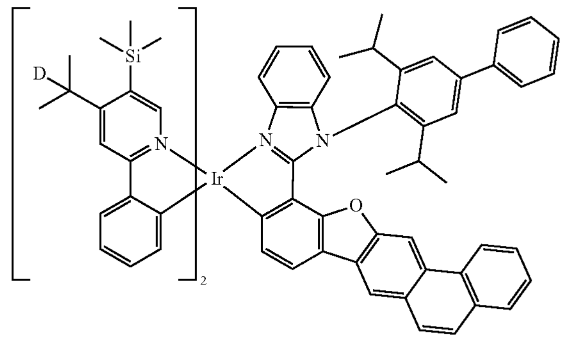
105
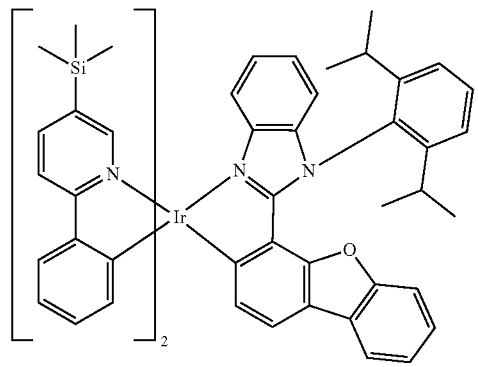
106
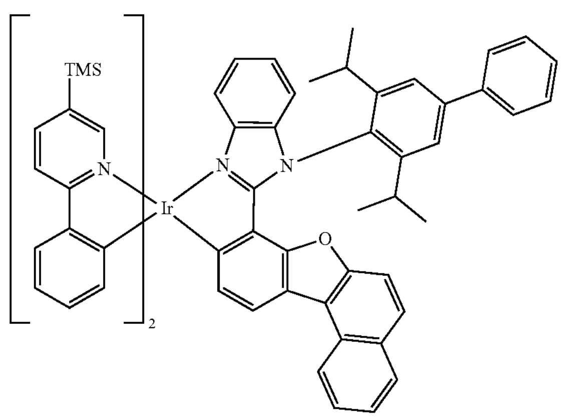
107
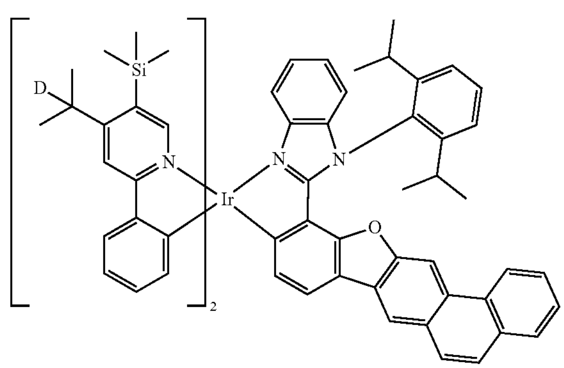

-continued
108
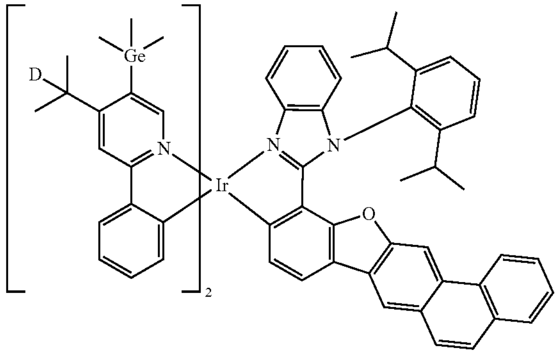
109
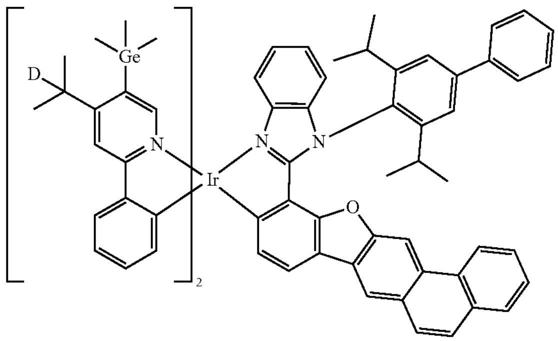
110
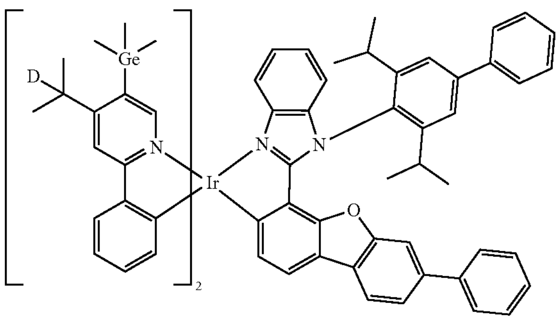
111
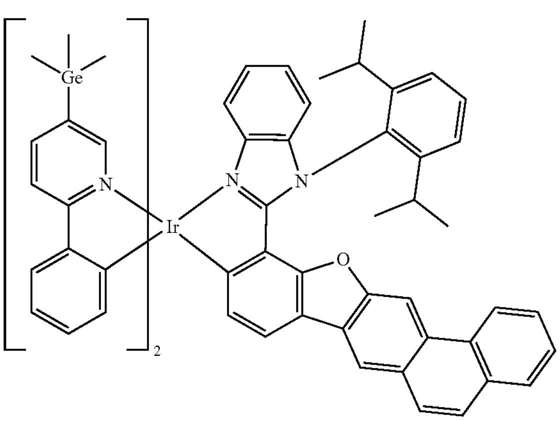
-continued
112
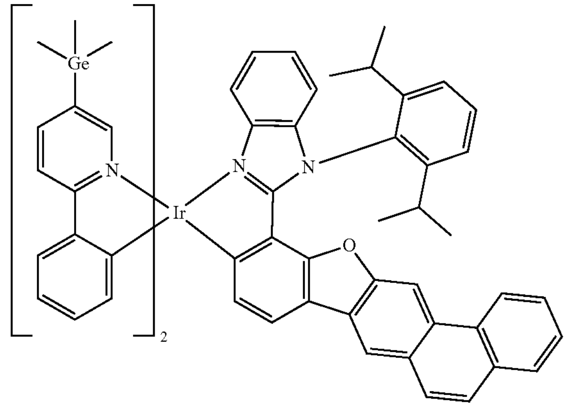
113
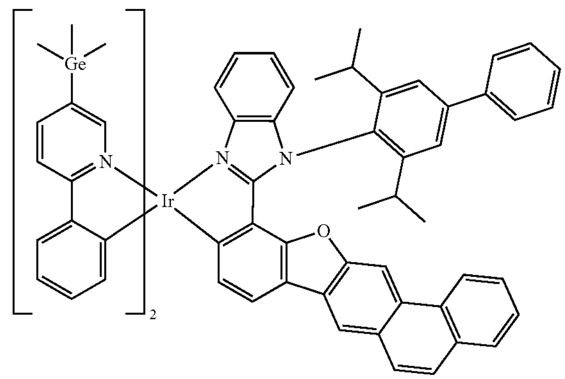
114
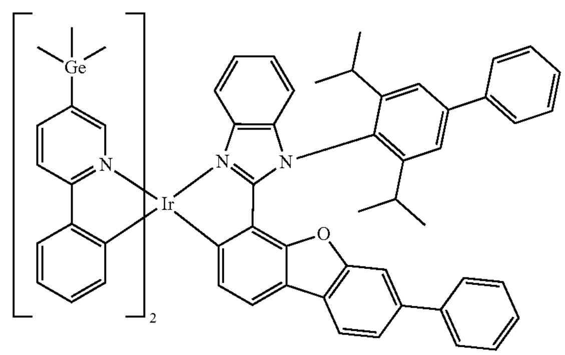
115
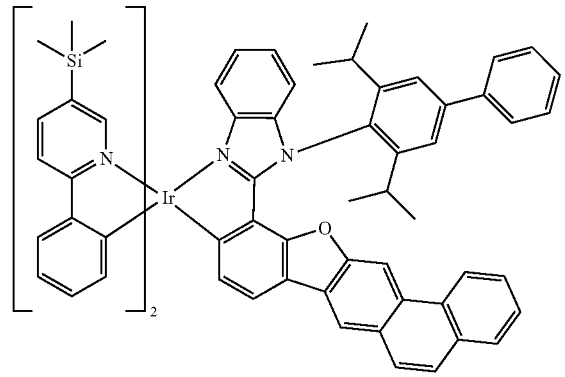

-continued
116
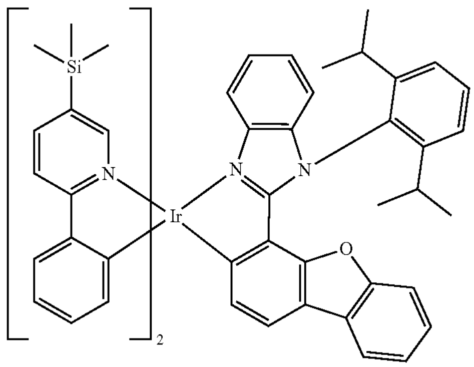
Group 1-5
1
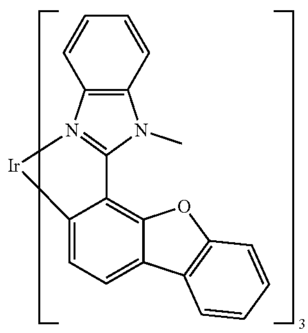
2
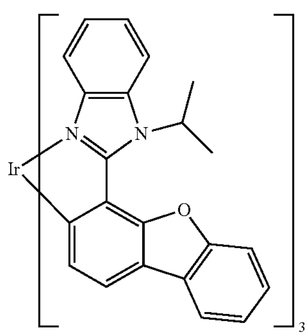
3
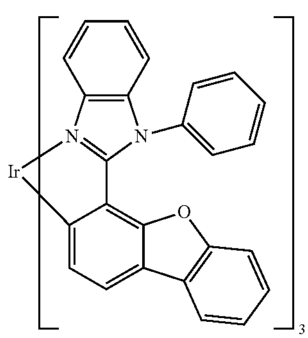
-continued
4
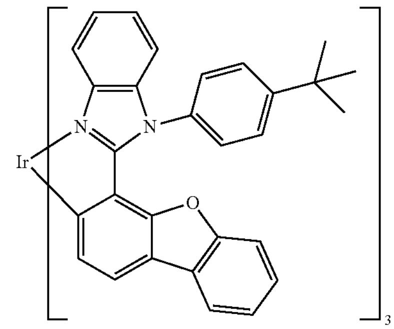
5
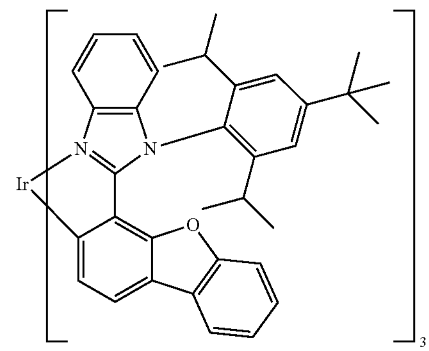
6
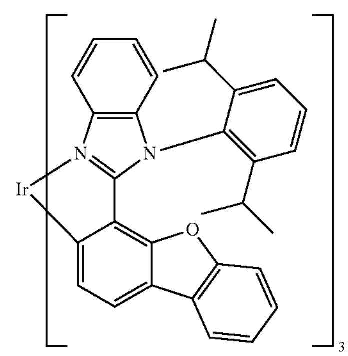
7
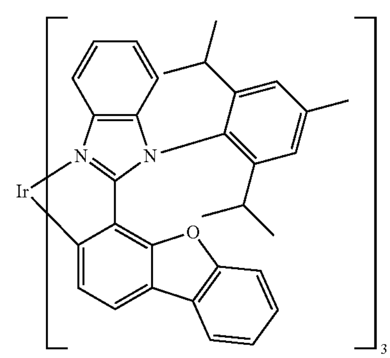

-continued
8
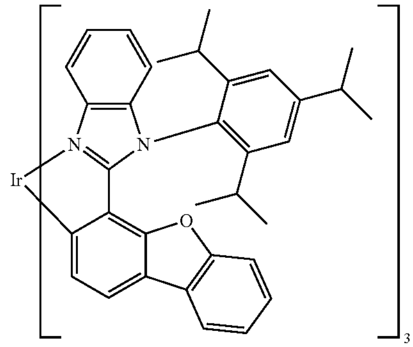
9
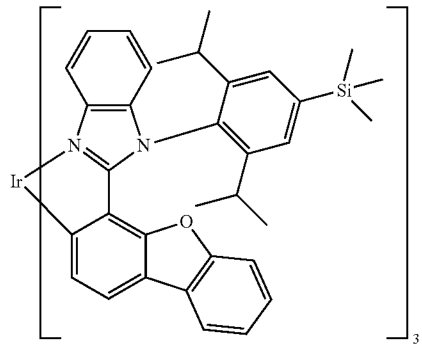
10
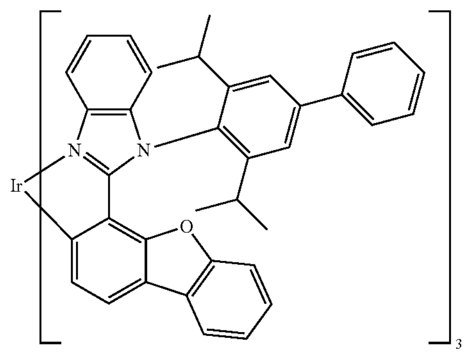
11
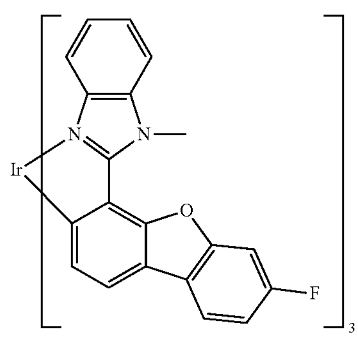
-continued
12
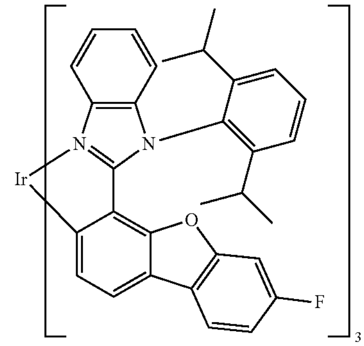
13
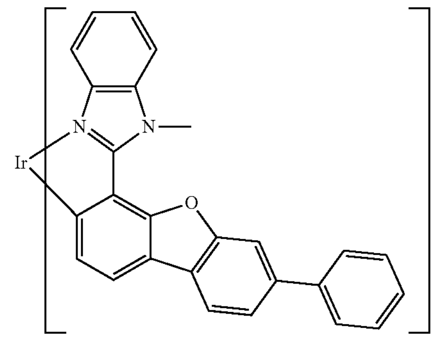
14
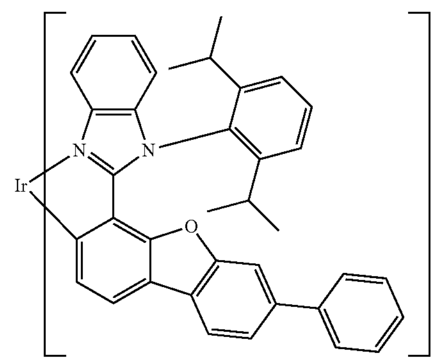
15
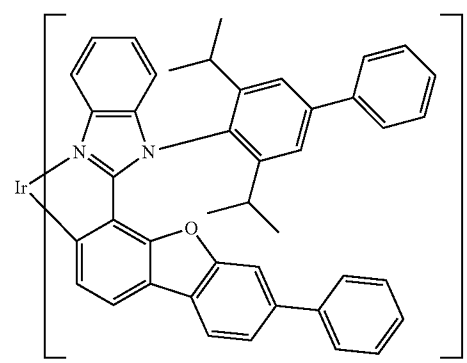

-continued
16
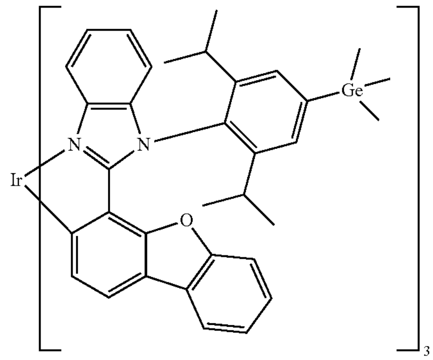
17
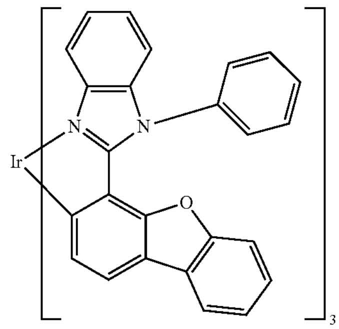
18
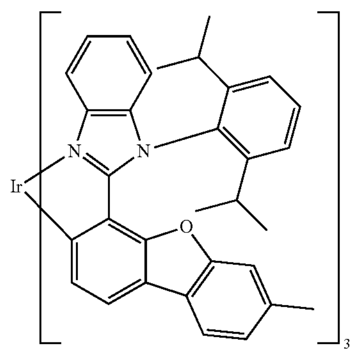
19
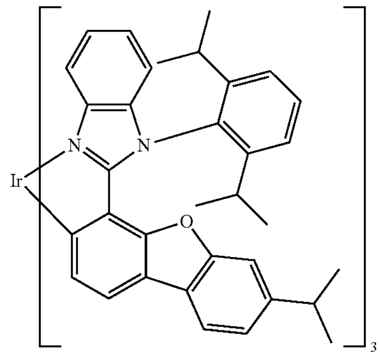
-continued
20
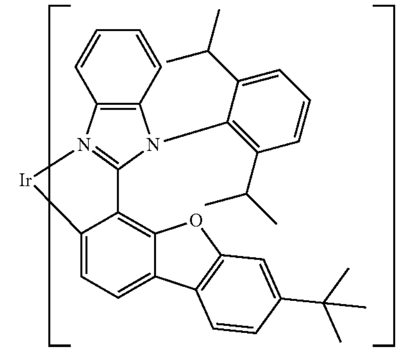
21
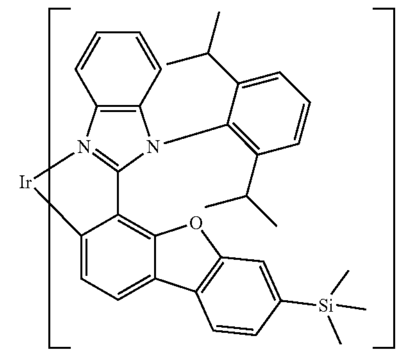
22
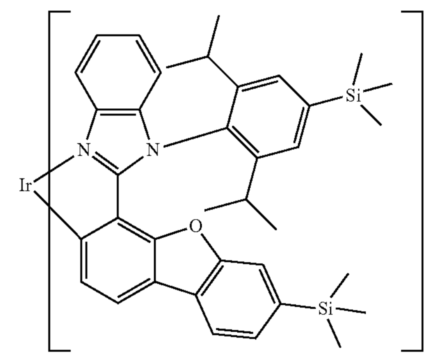
23
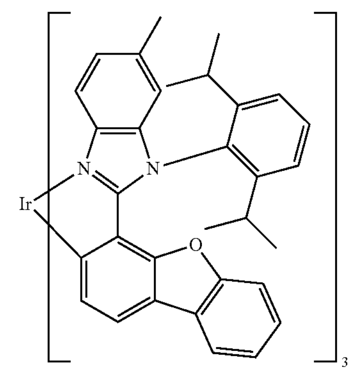

24
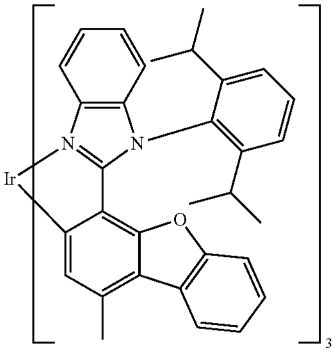
25
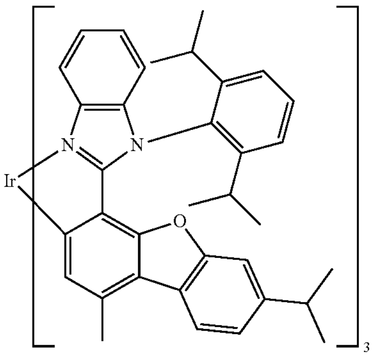
26
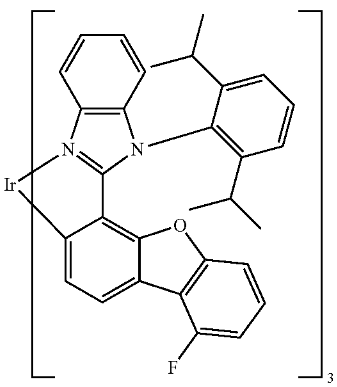
27
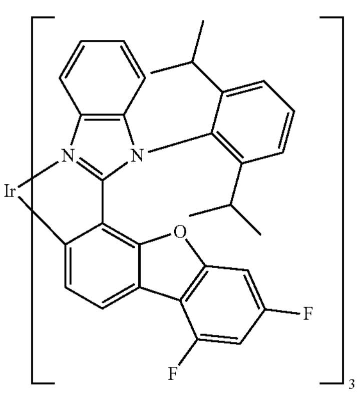
28
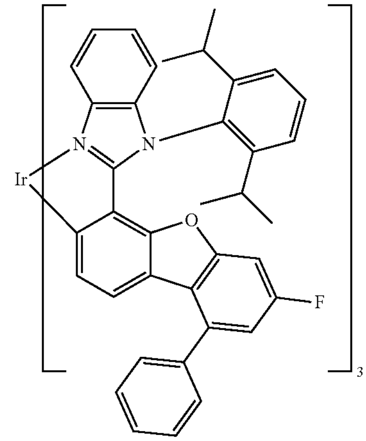
29
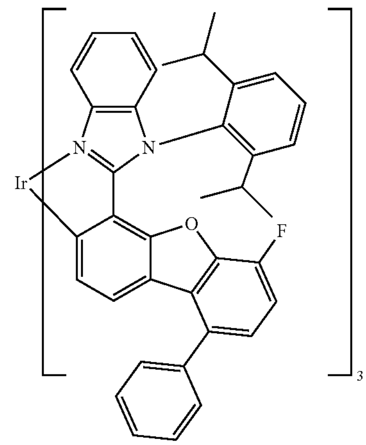
30
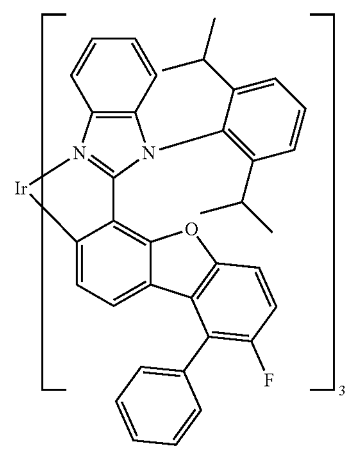

-continued
31
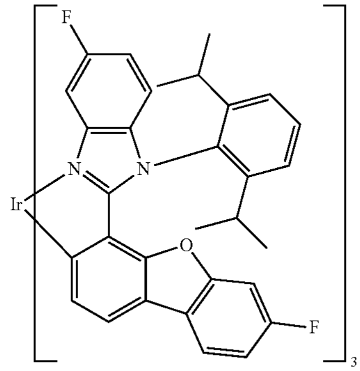
32
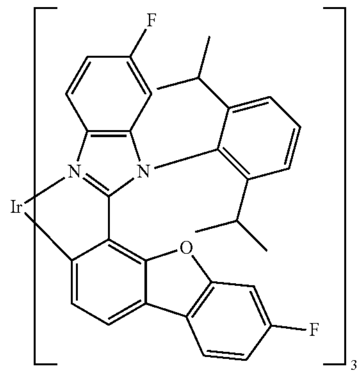
33
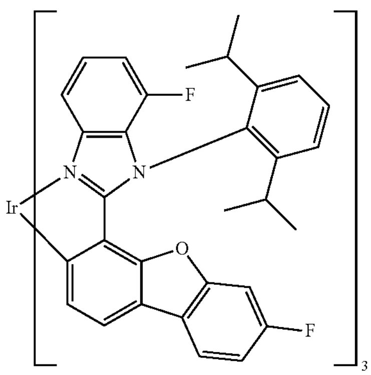
34
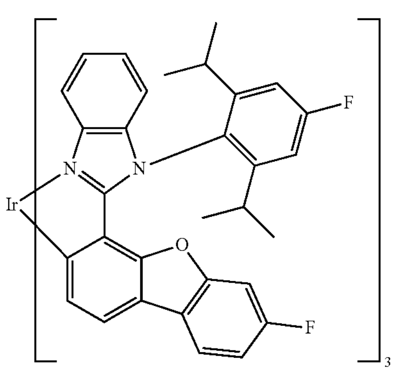
-continued
35
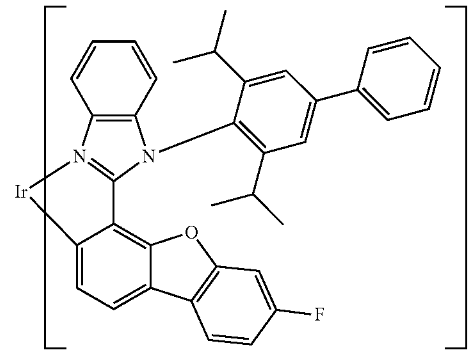
36
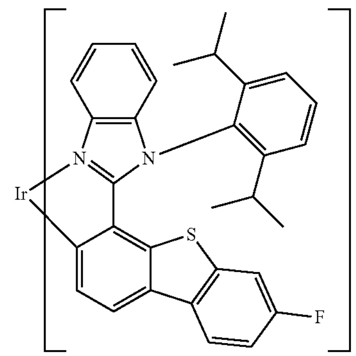
37
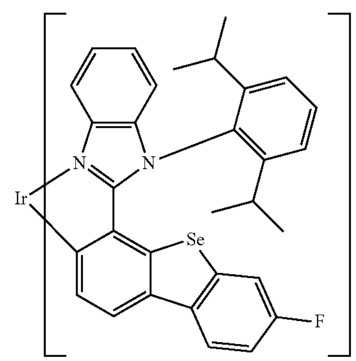
38
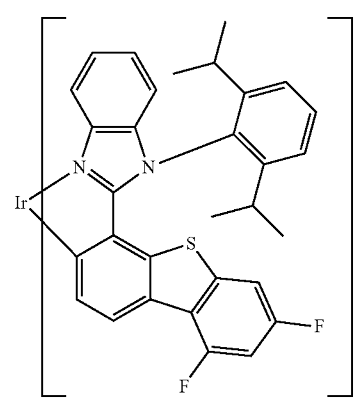

39
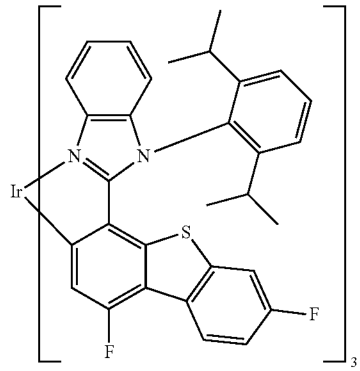
40
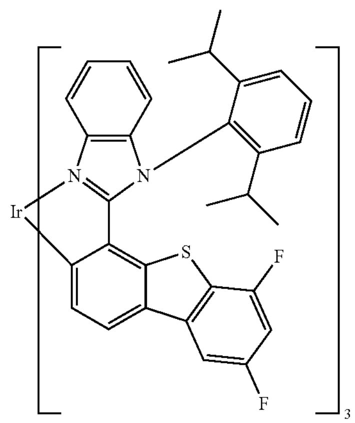
41
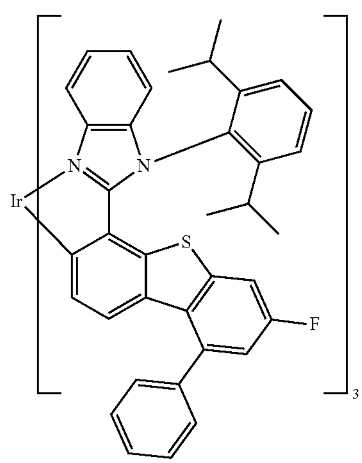
42
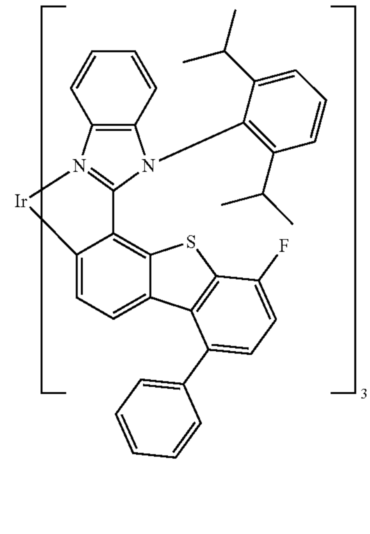
43
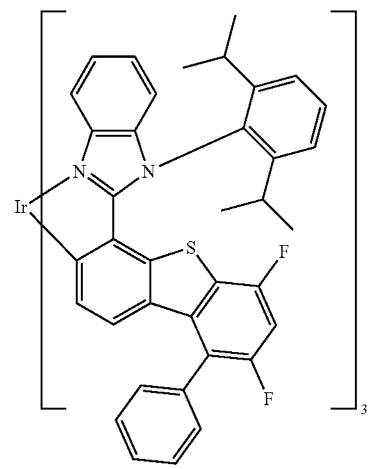
44
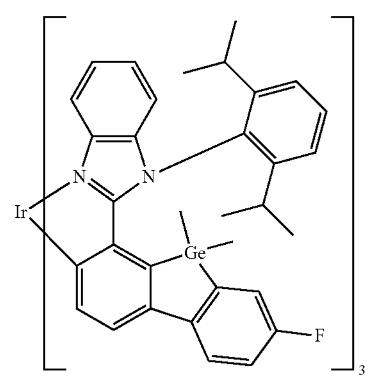

-continued
45
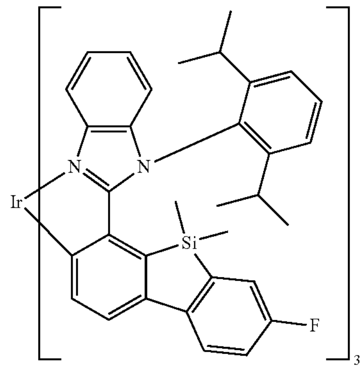
46
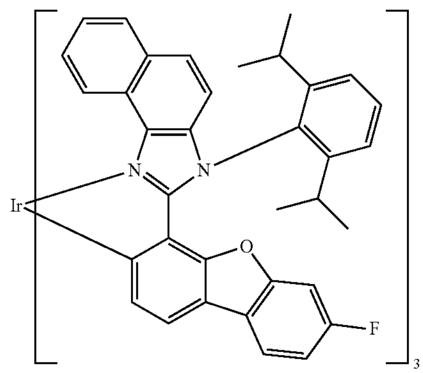
47
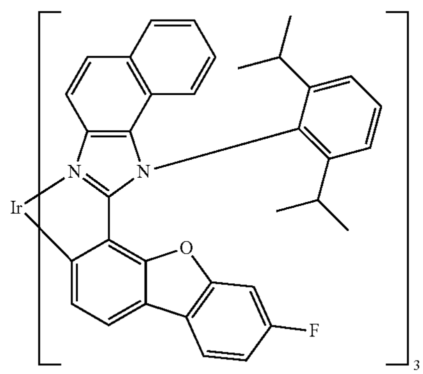
48
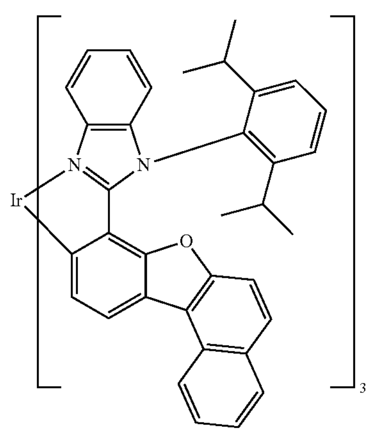
-continued
49
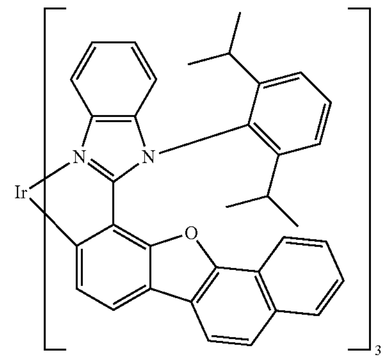
50
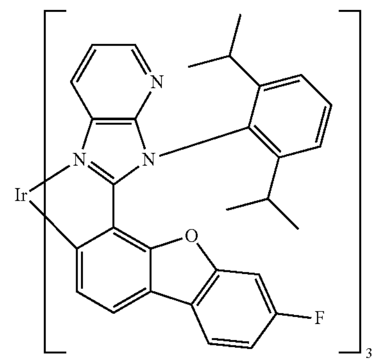
Group 1-6
1
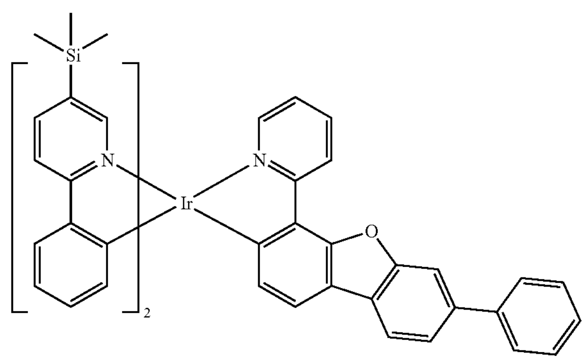
2
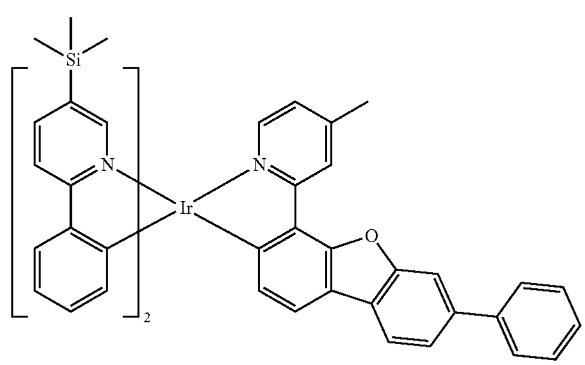

3
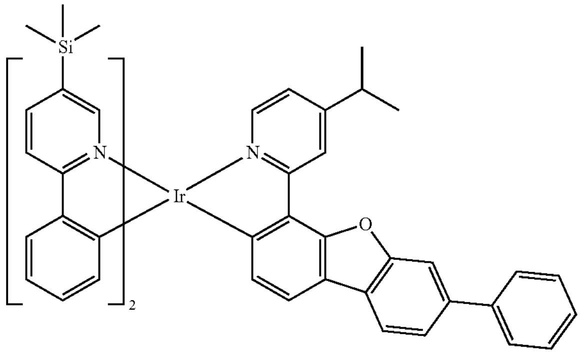
4
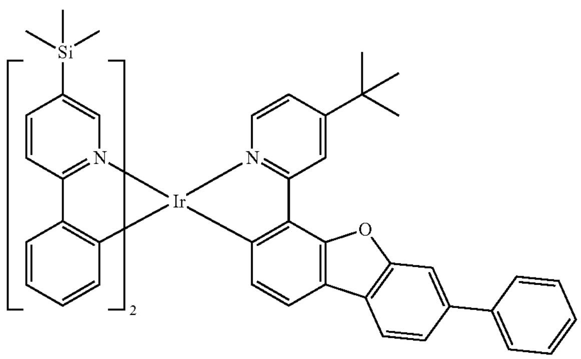
5
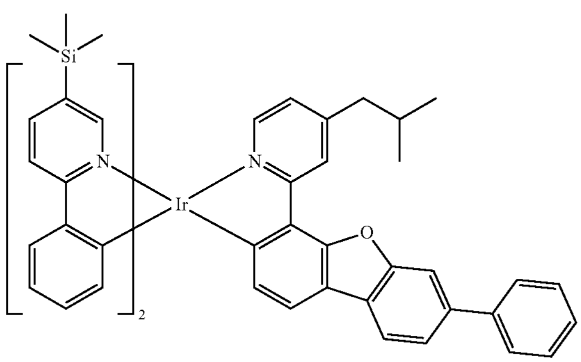
6
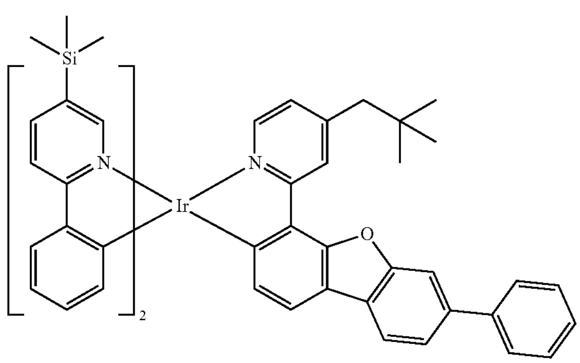
7
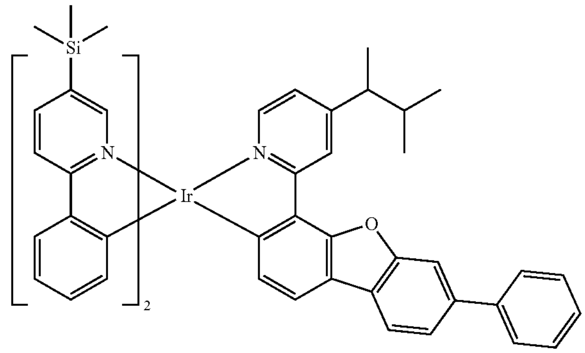
8
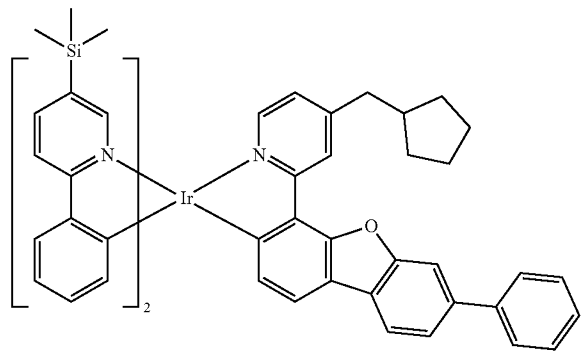
9
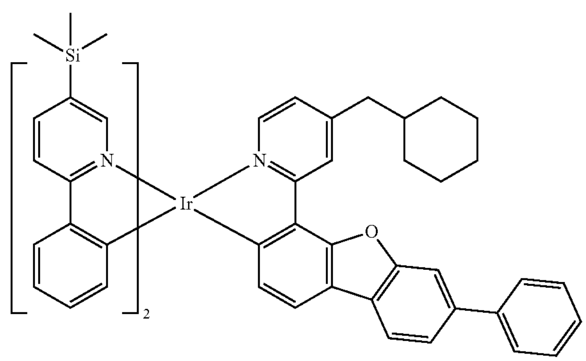
10
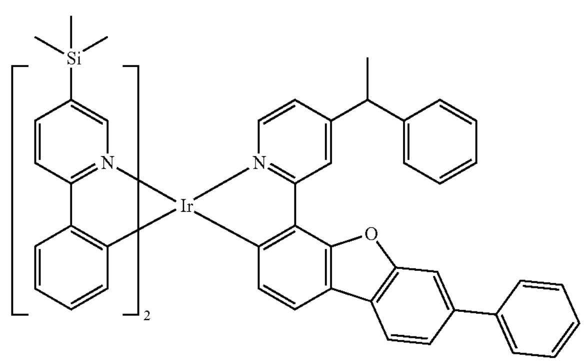

-continued
11
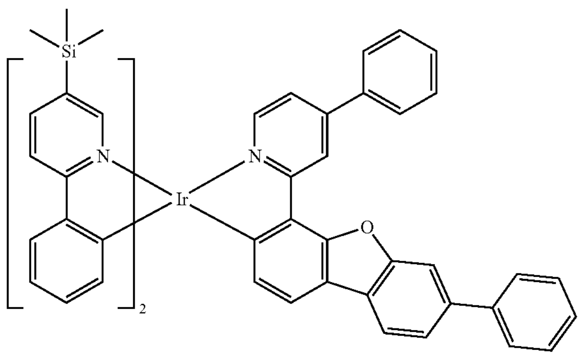
12
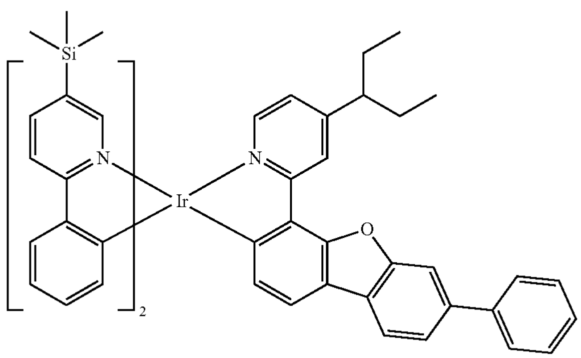
13
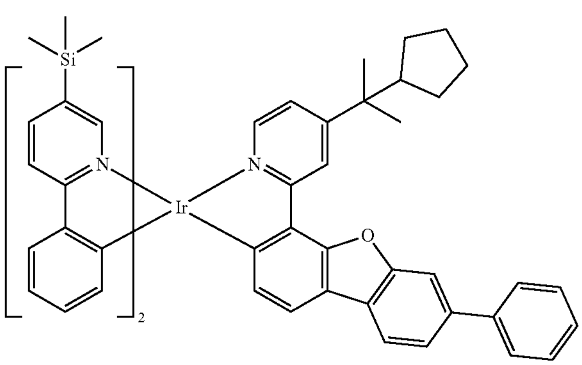
14
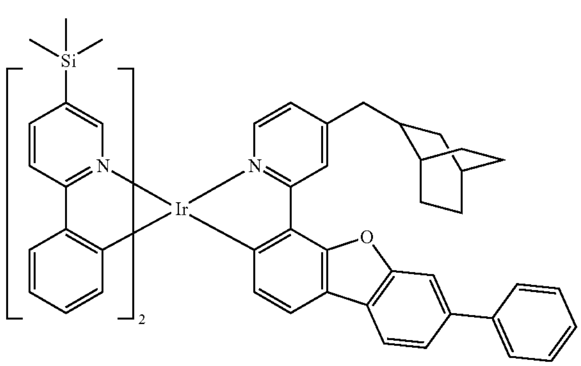
-continued
15
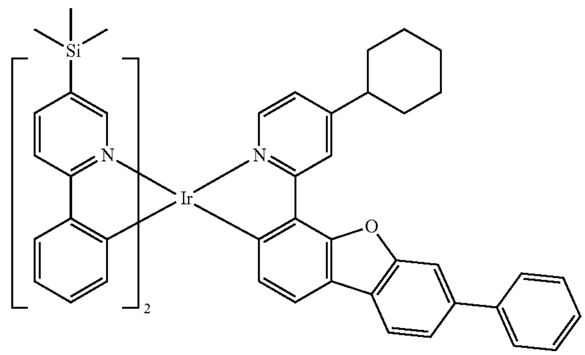
16
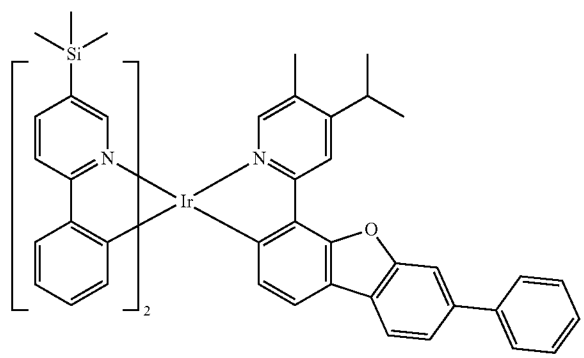
17
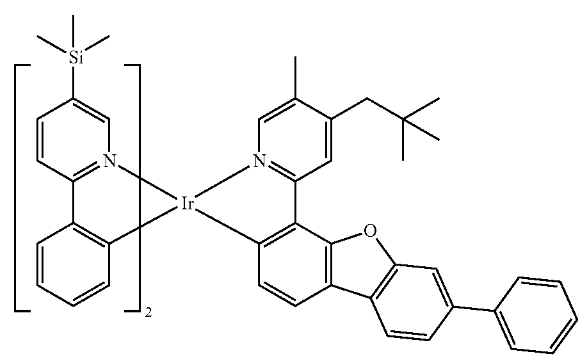
18
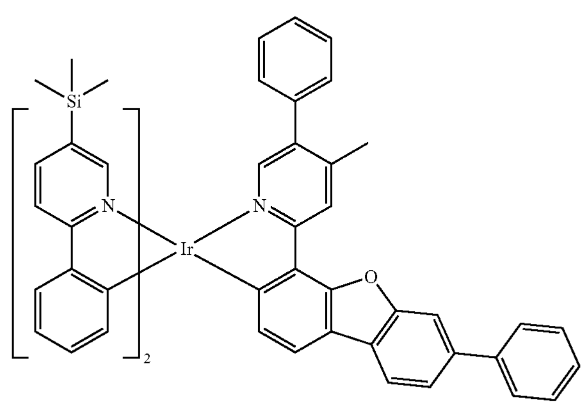

-continued
19
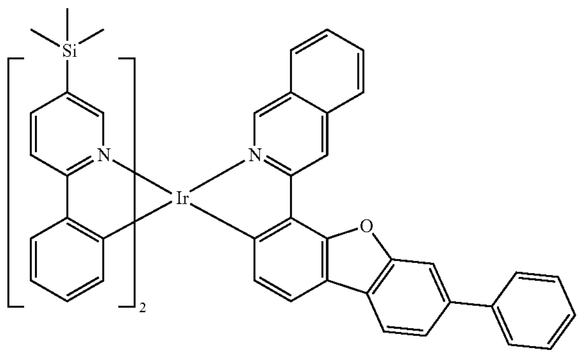
20
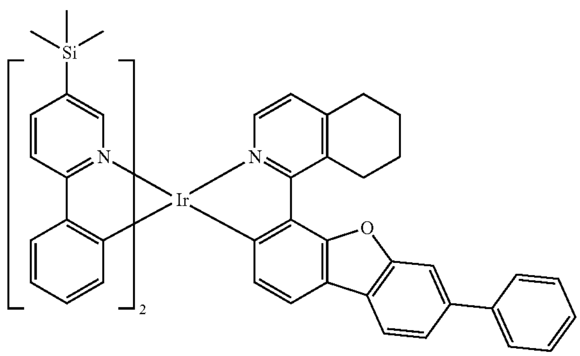
21
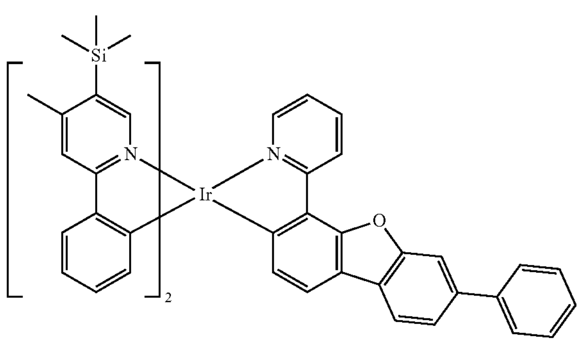
22
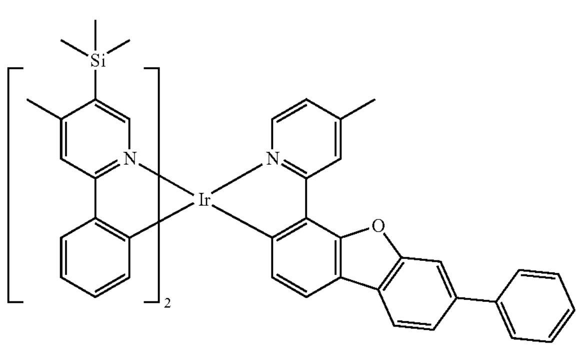
-continued
23
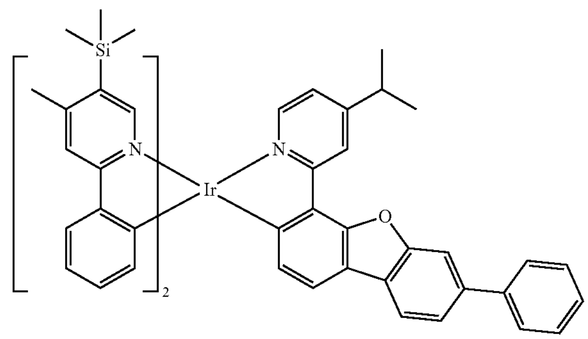
24
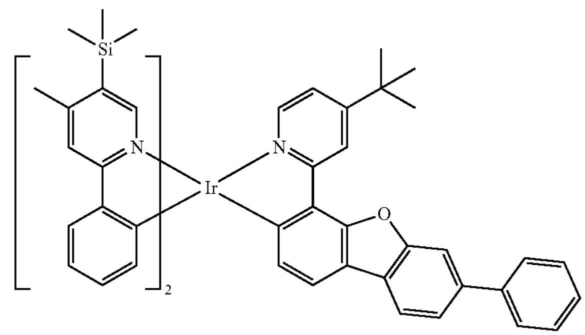
25
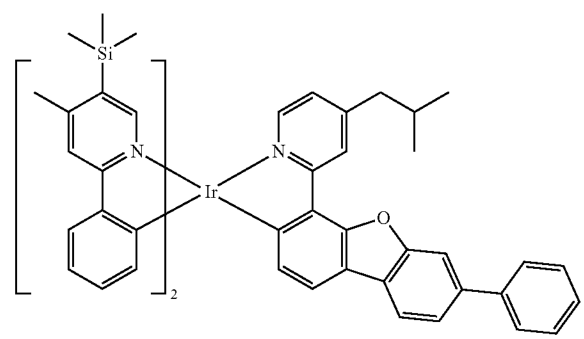
26
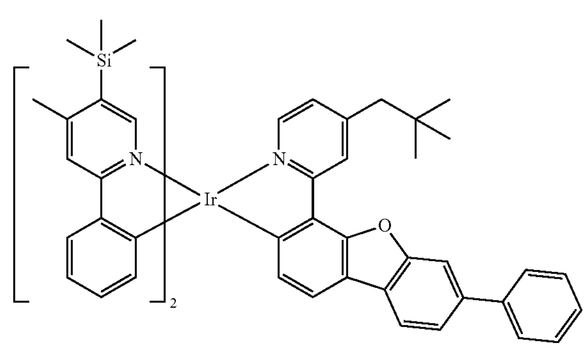

-continued
27
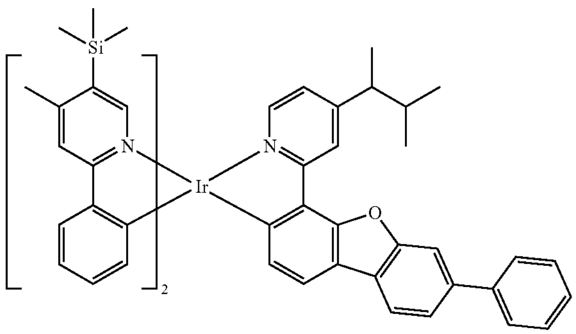
28
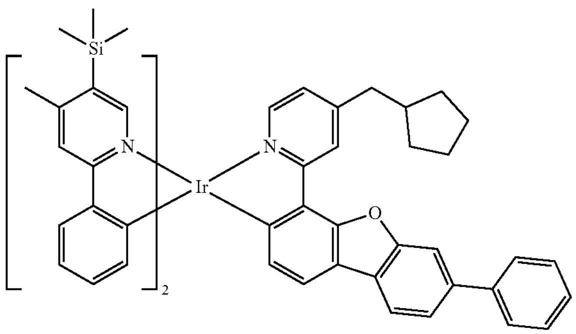
29
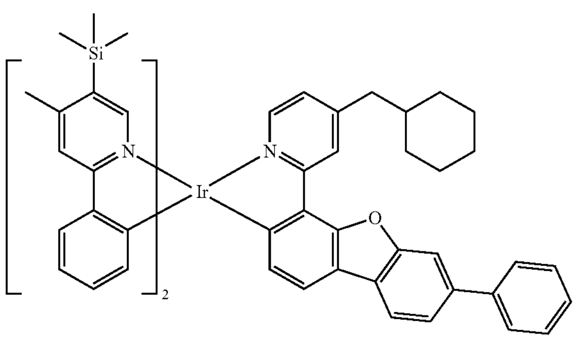
30
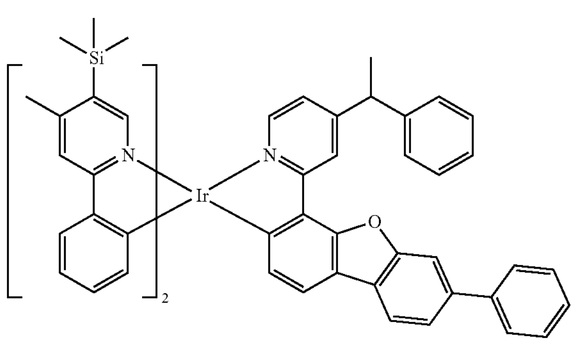
-continued
31
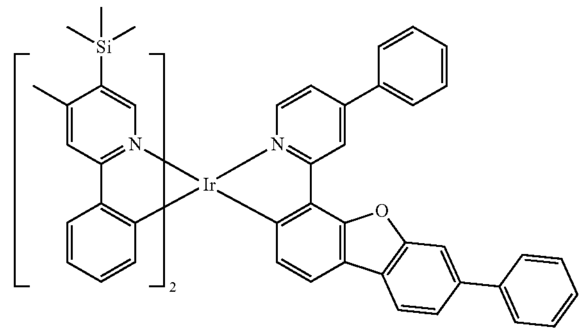
32
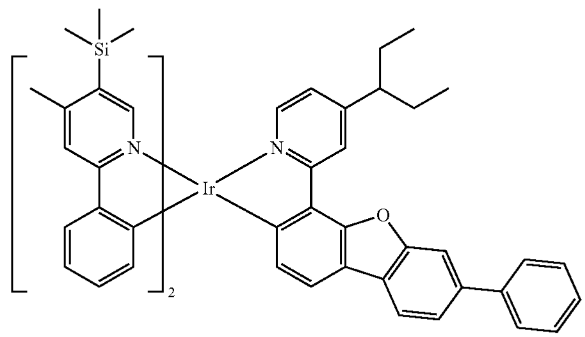
33
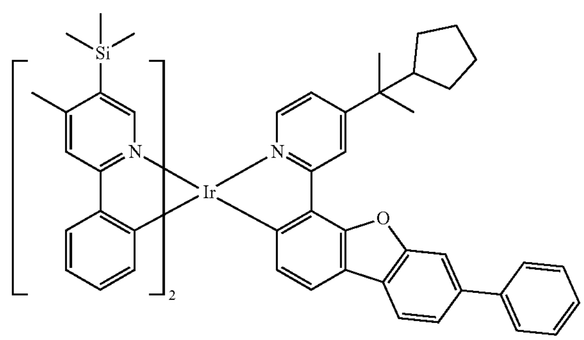
34
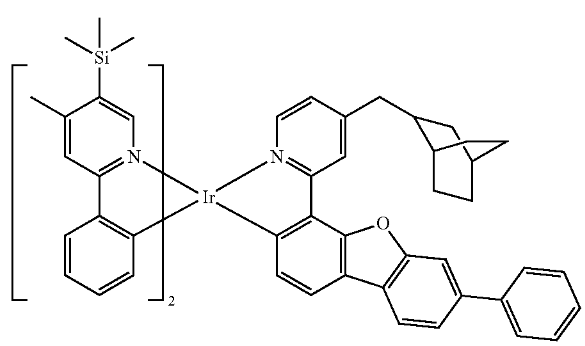

-continued
35
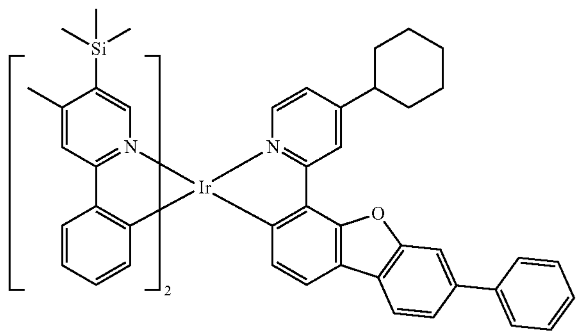
36
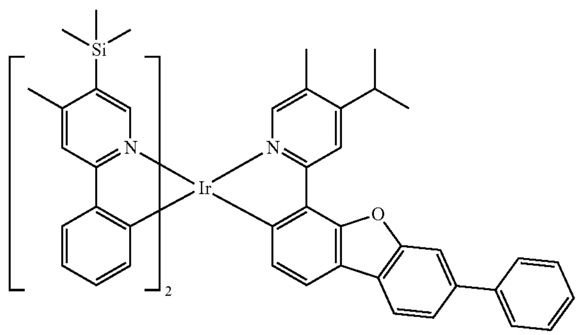
37
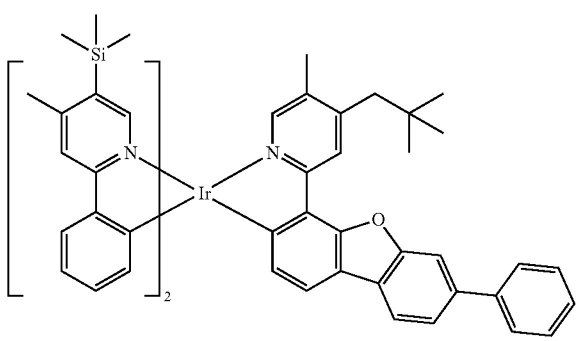
38
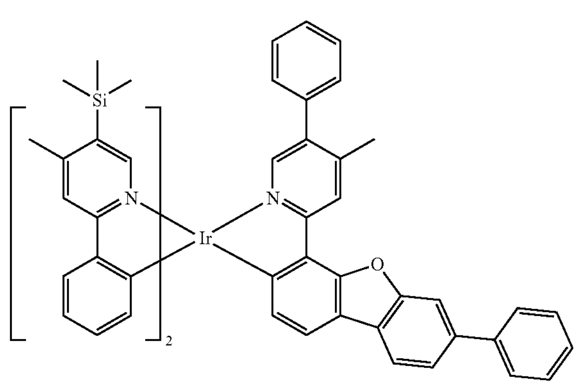
-continued
39
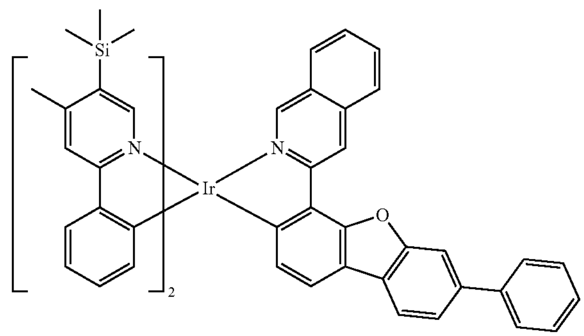
40
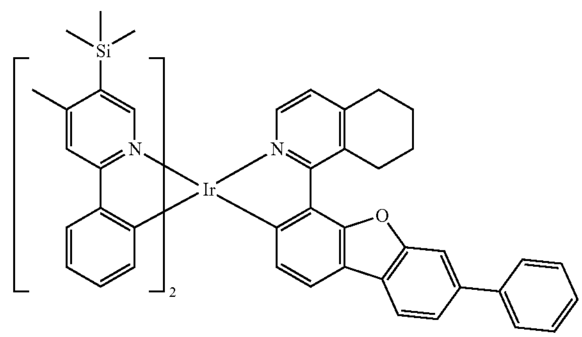
41
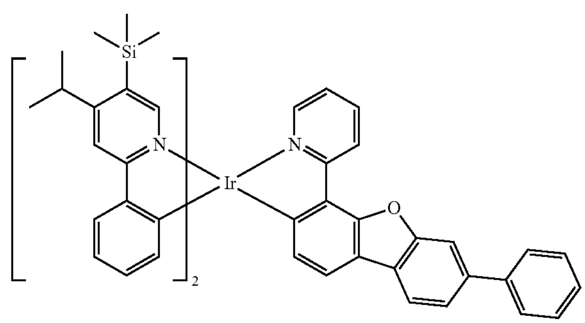
42
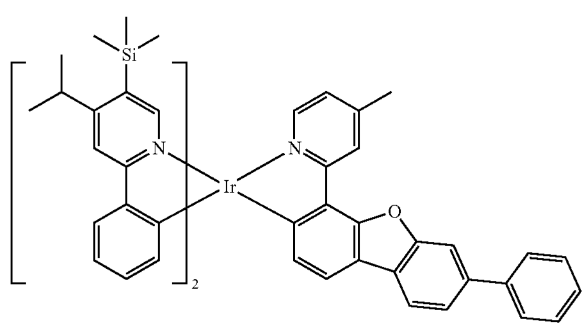

-continued
43
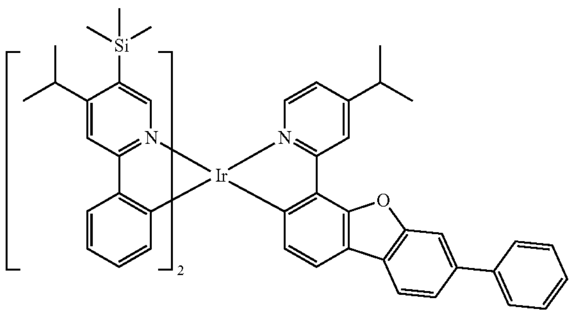
44
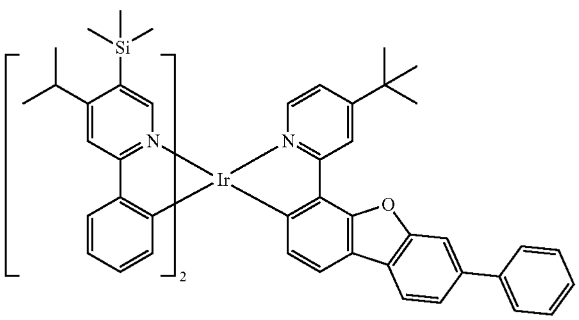
45
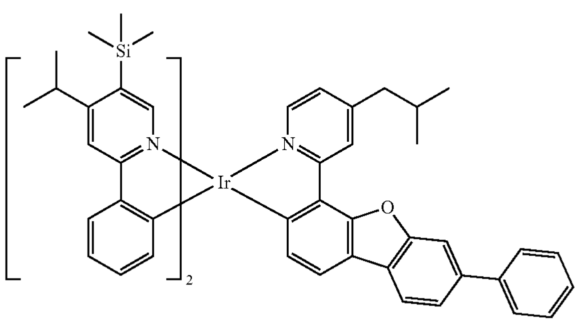
46
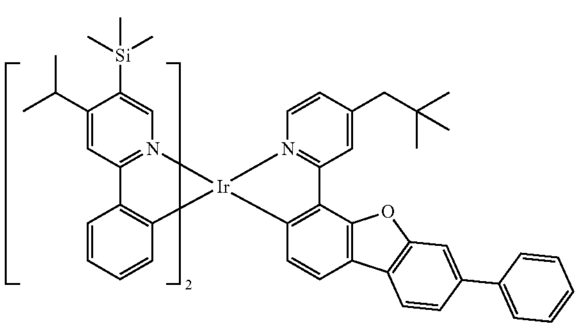
-continued
47
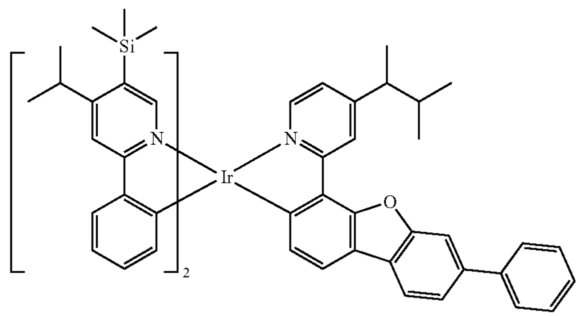
48
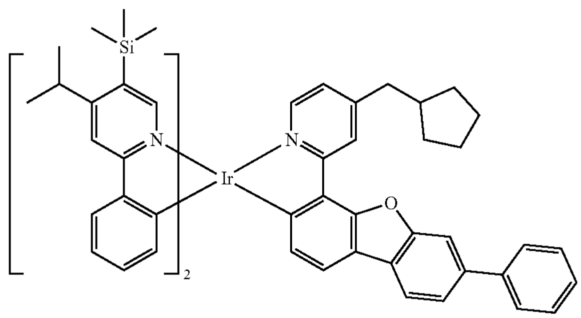
49
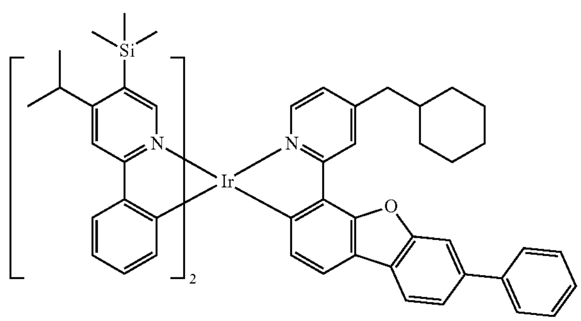
50
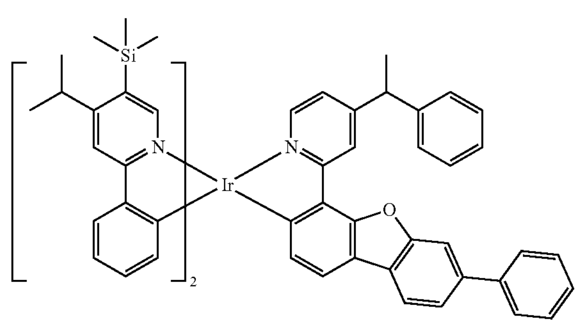

-continued
51
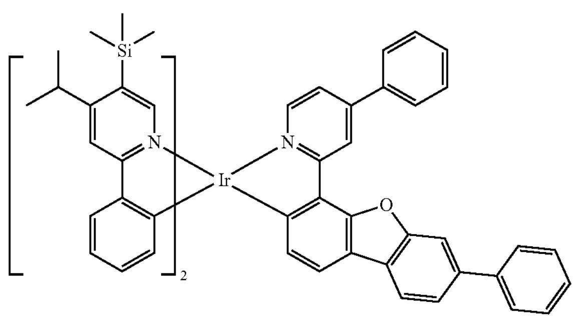
52
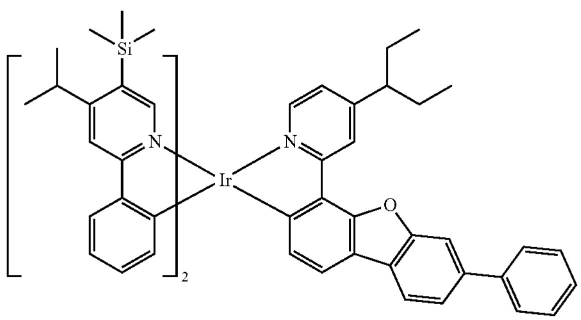
53
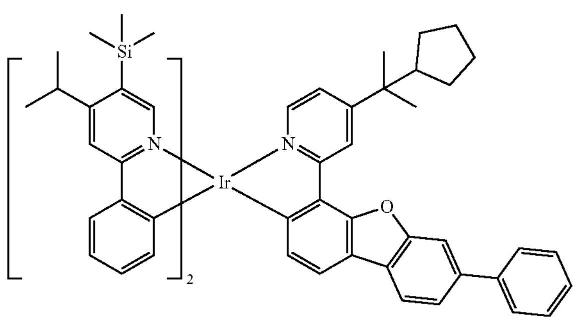
54
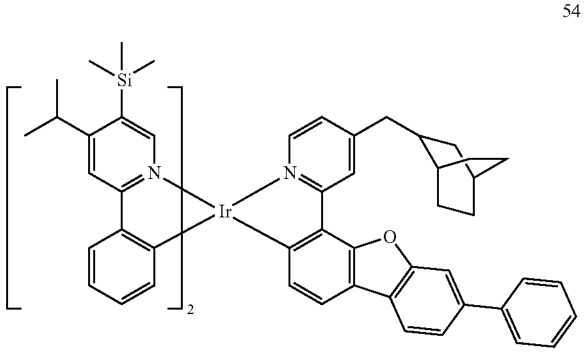
-continued
55
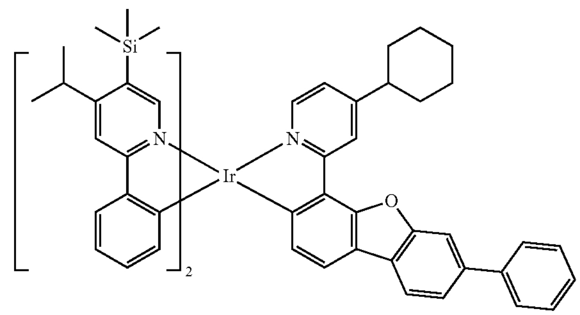
56
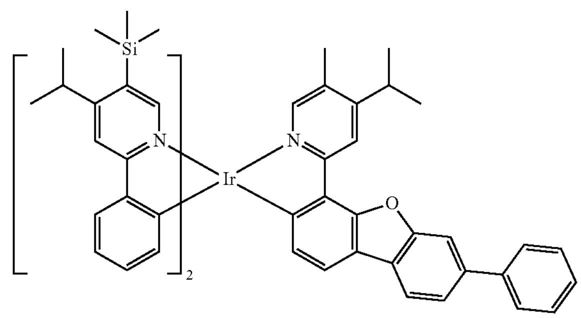
57
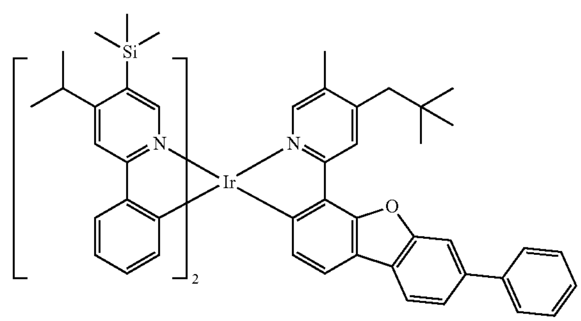
58
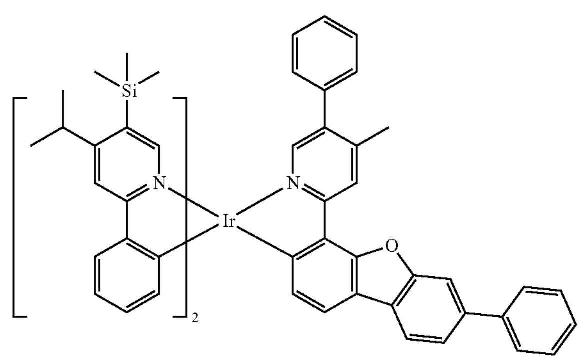

-continued
59
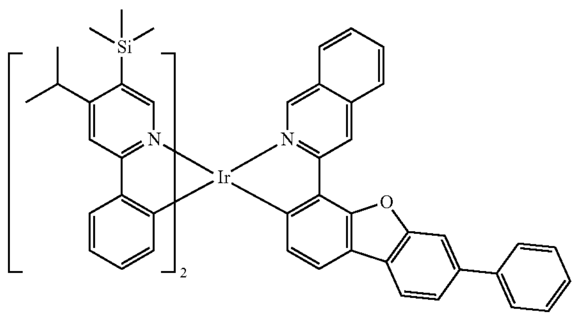
60
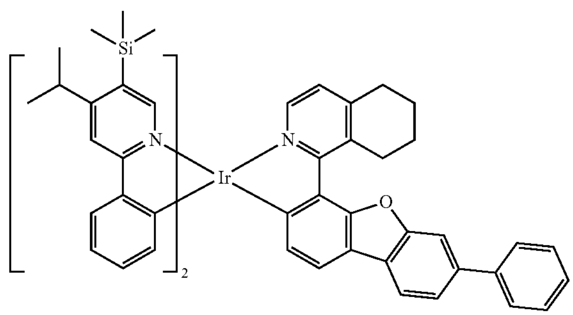
61
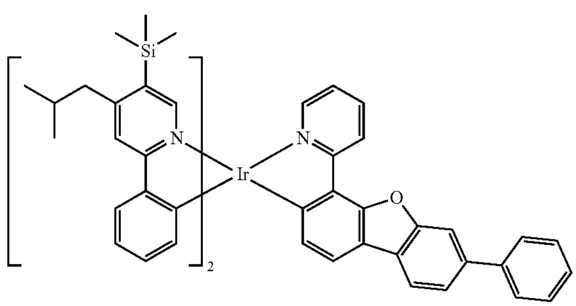
62
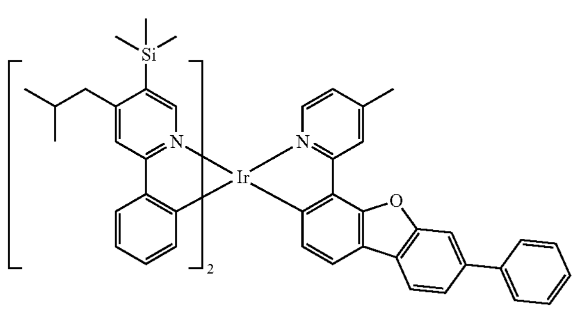
63
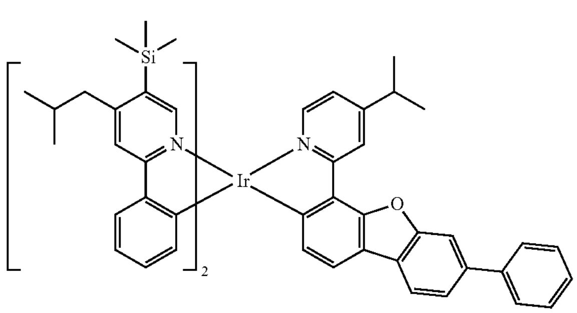
-continued
64
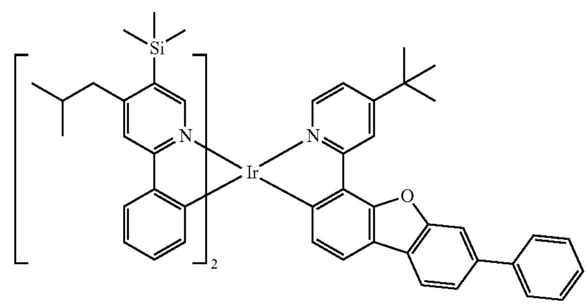
65
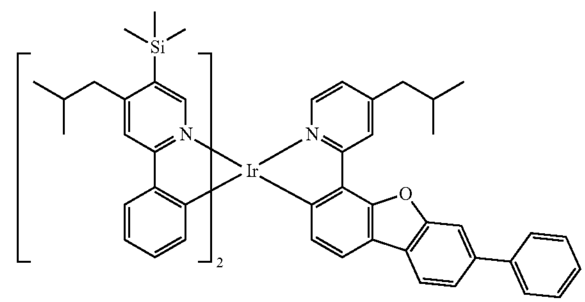
66
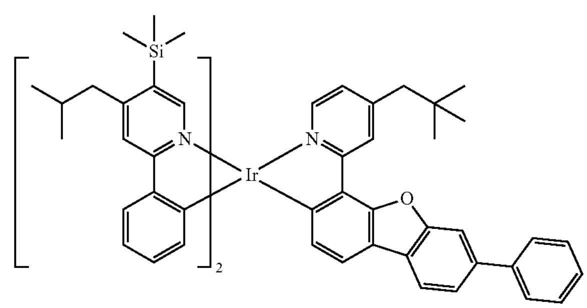
67
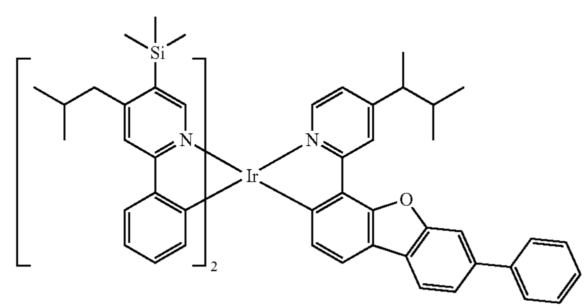
68
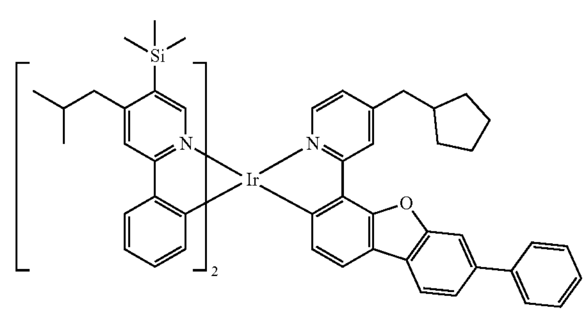

-continued
69
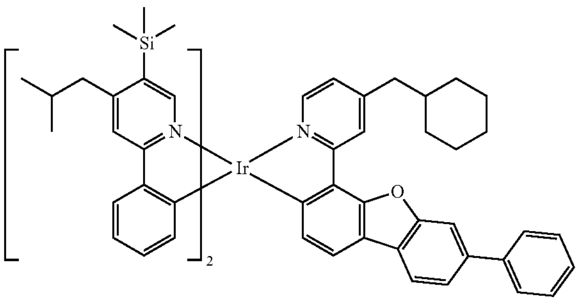
70
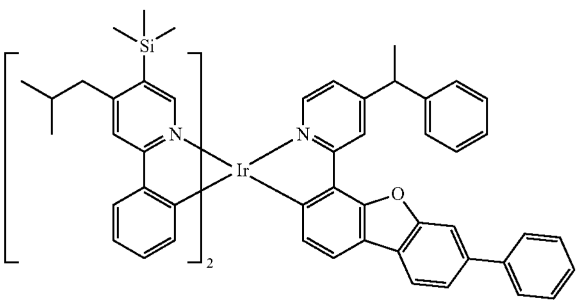
71
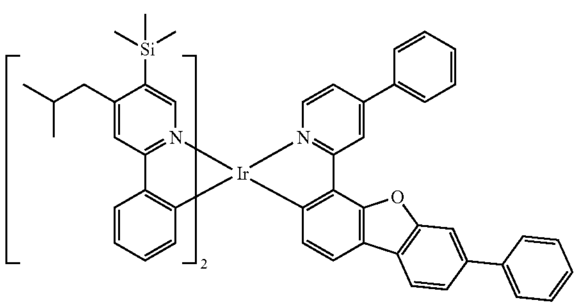
72
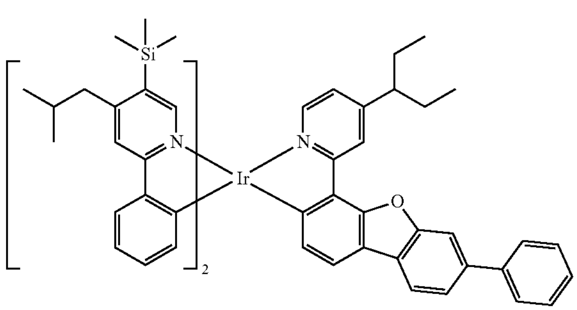
73
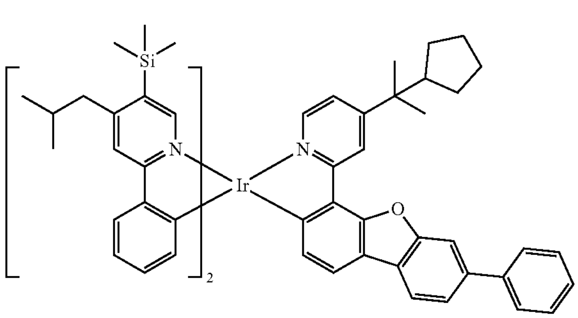
-continued
74
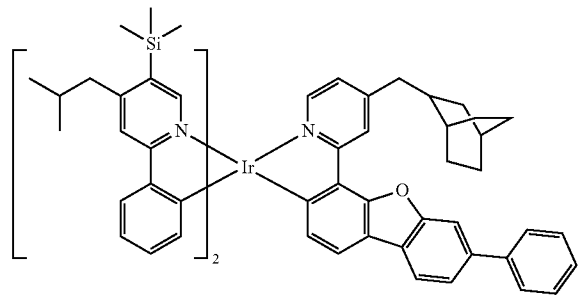
75
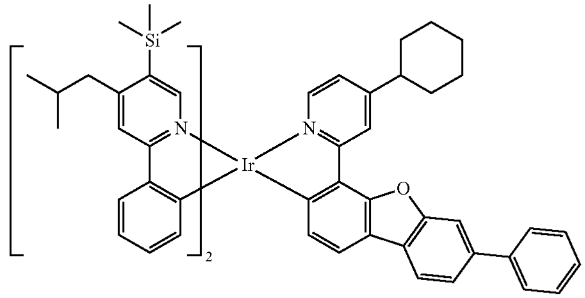
76
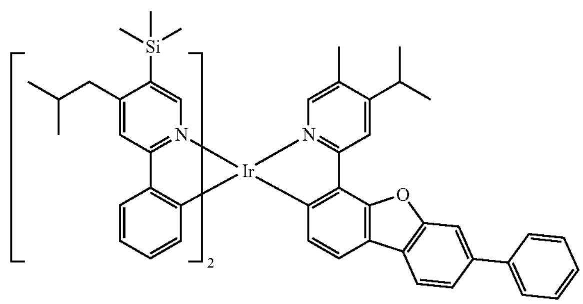
77
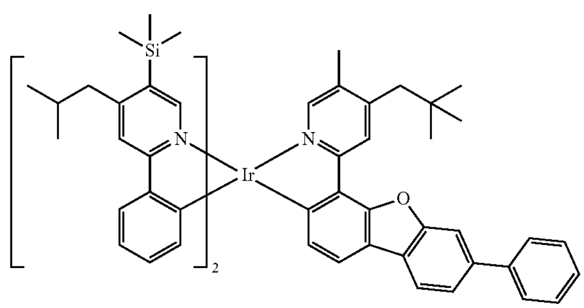
78
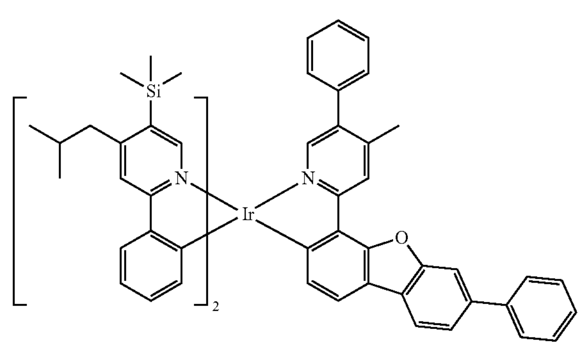

-continued
79
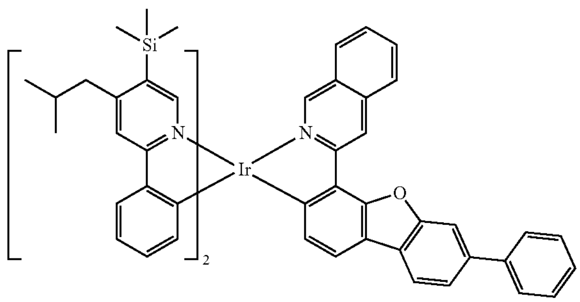
80
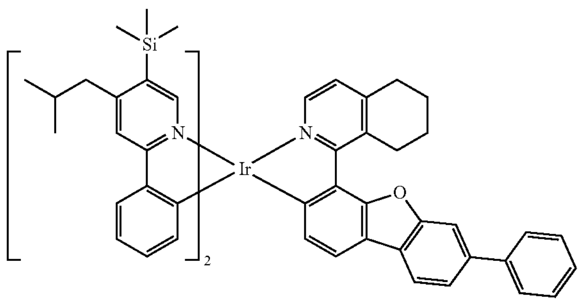
81
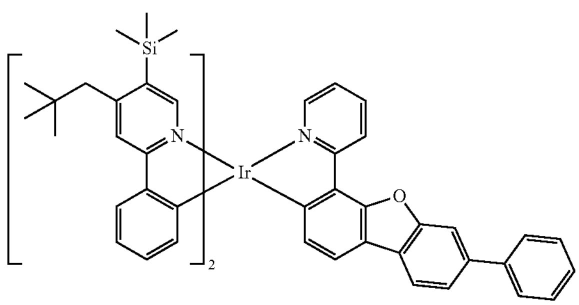
82
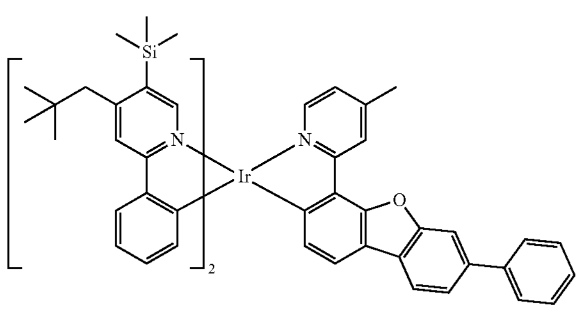
83
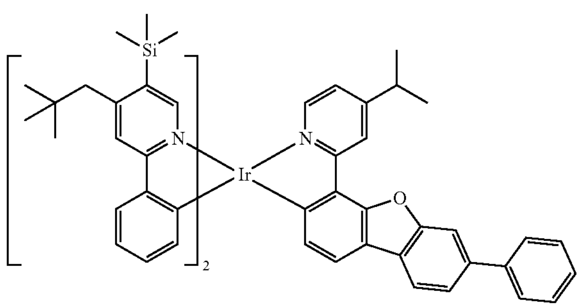
-continued
84
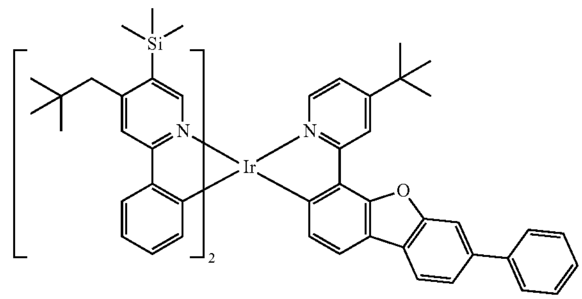
85
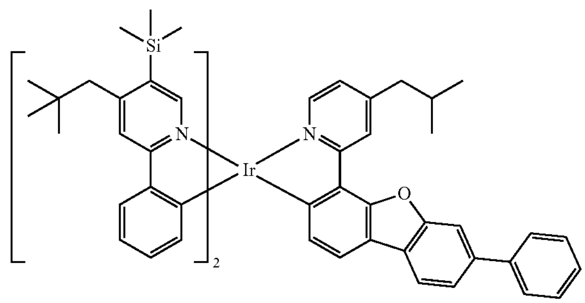
86
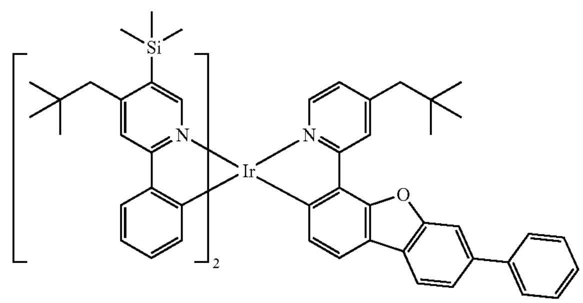
87
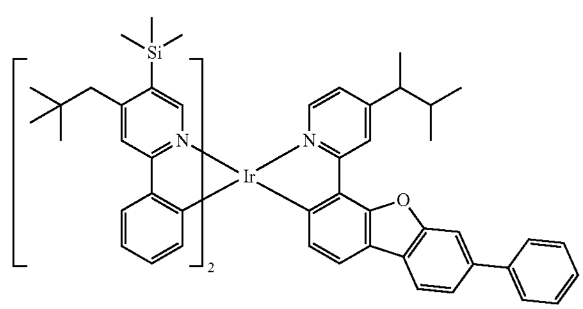
88
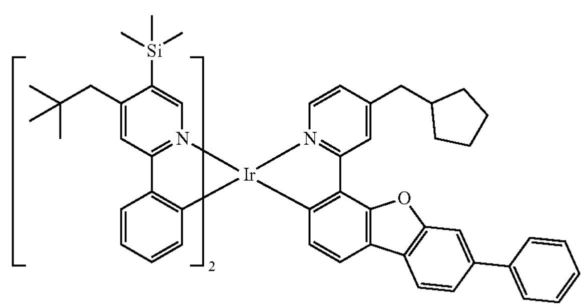

-continued
89
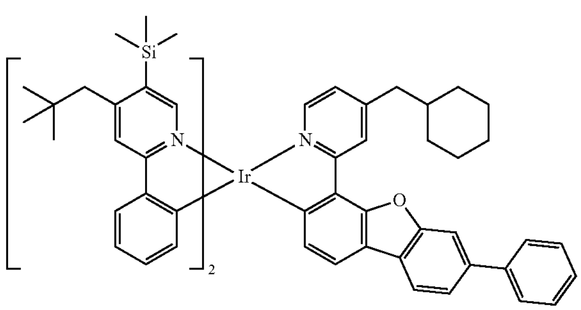
90
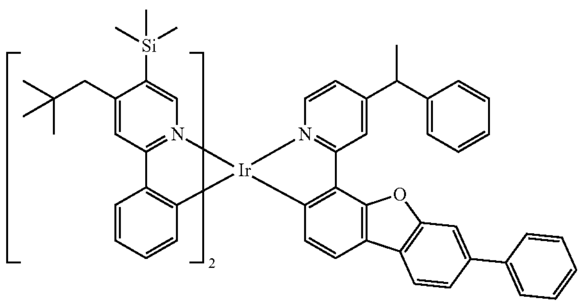
91
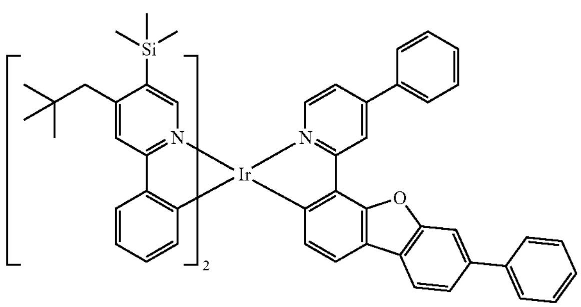
92
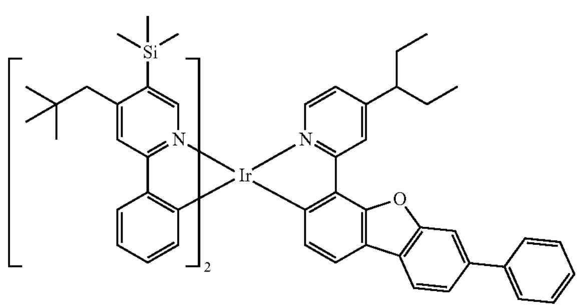
93
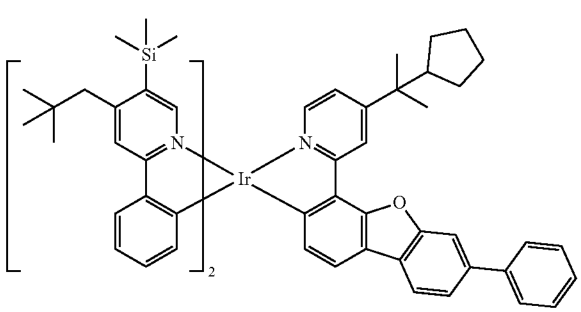
-continued
94
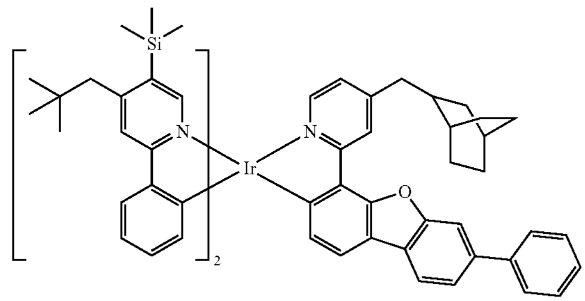
95
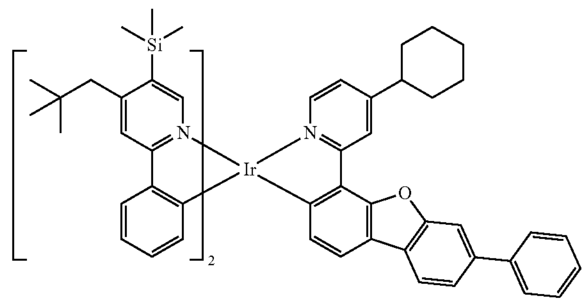
96
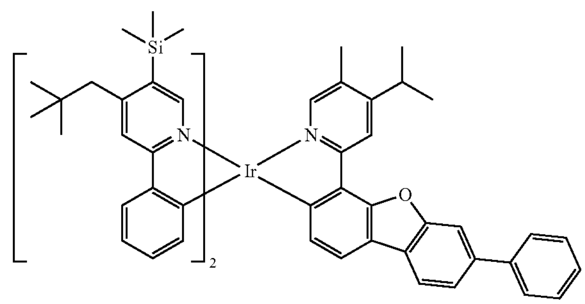
97
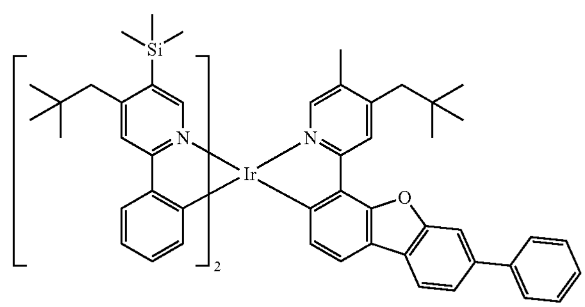
98
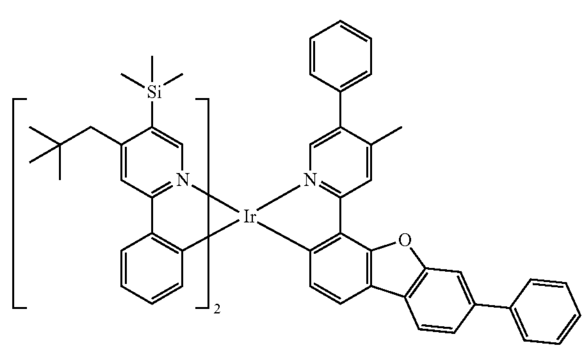

-continued
99
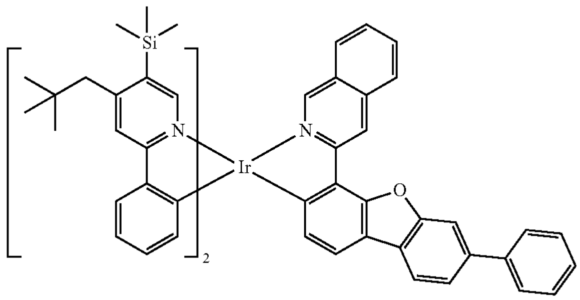
100
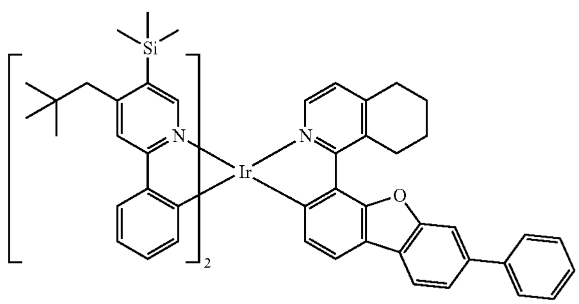
101
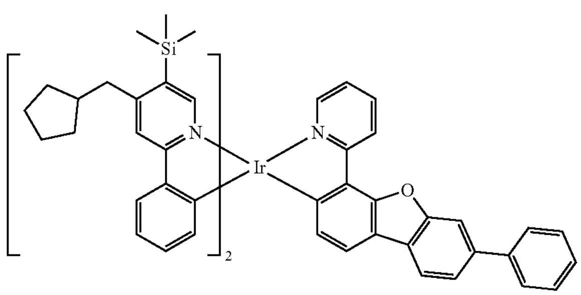
102
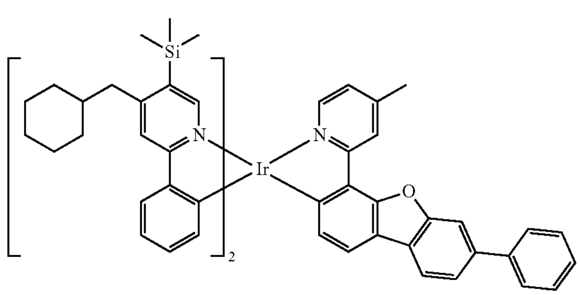
103
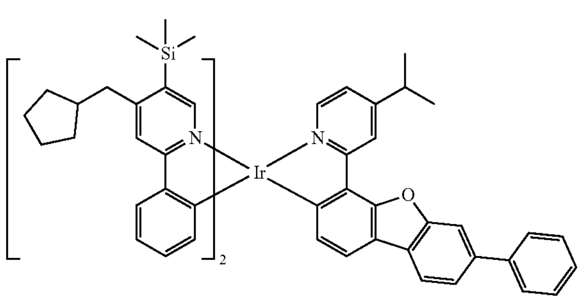
-continued
104
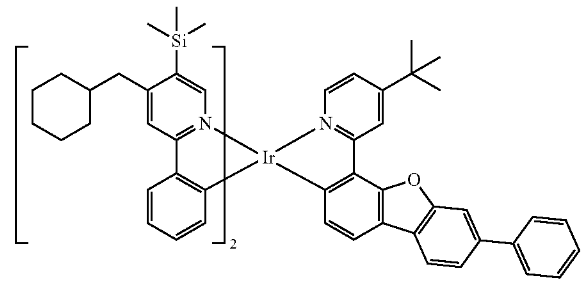
105
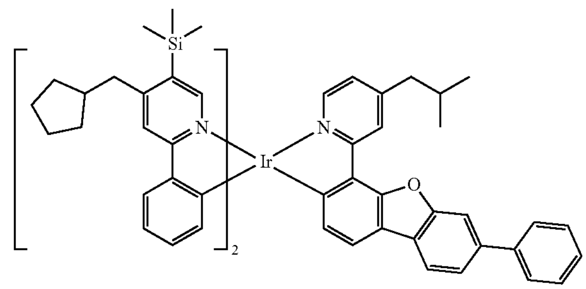
106
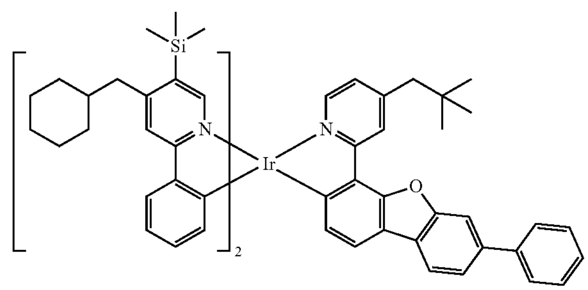
107
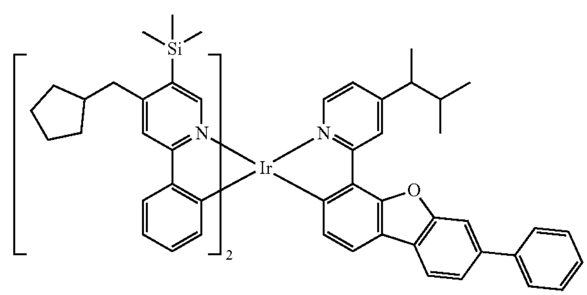
108
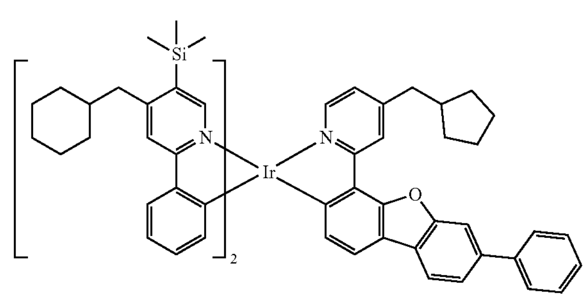

-continued
109
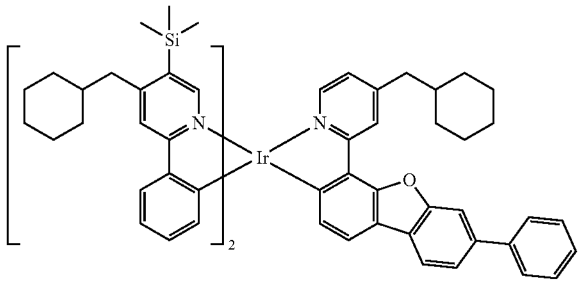
110
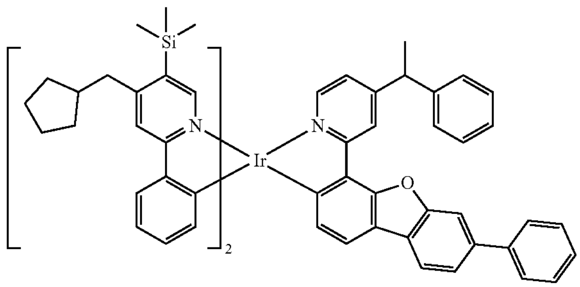
111
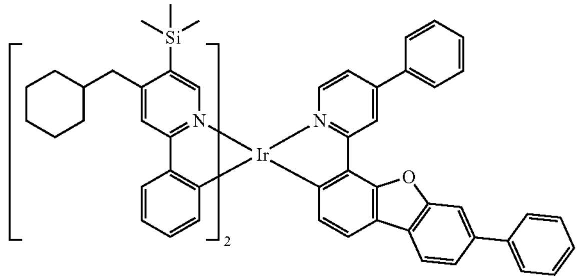
112
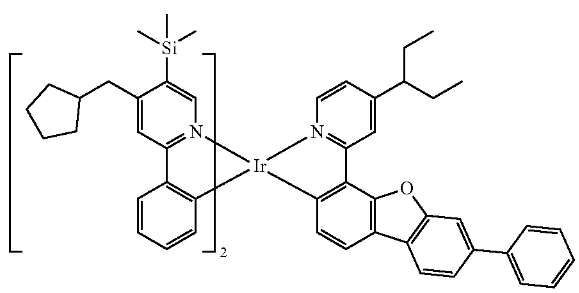
113
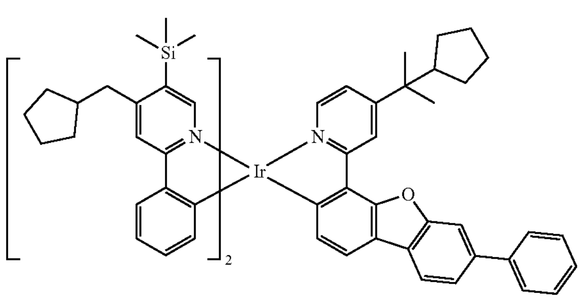
-continued
114
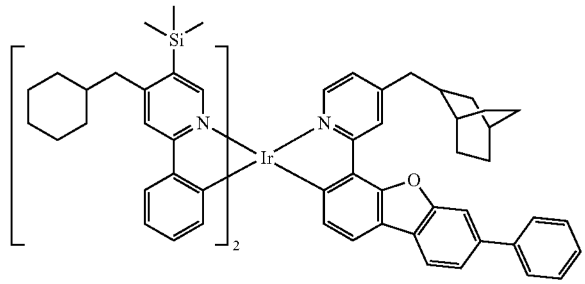
115
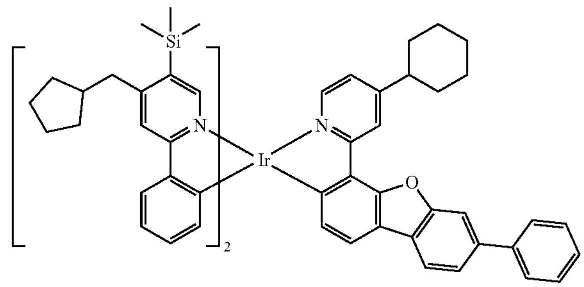
116
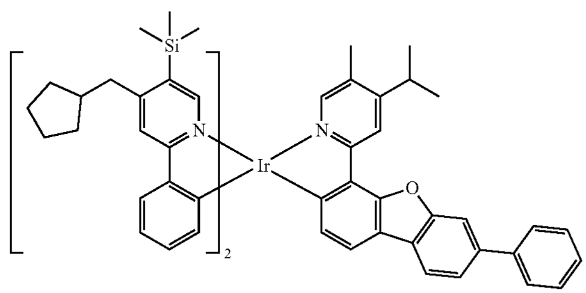
117
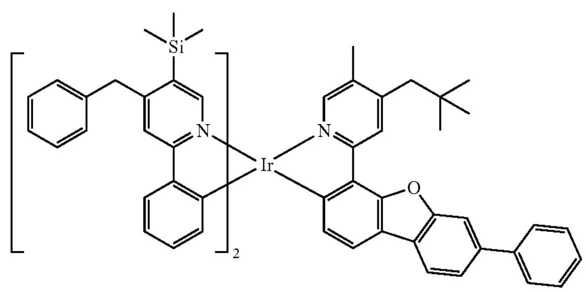
118
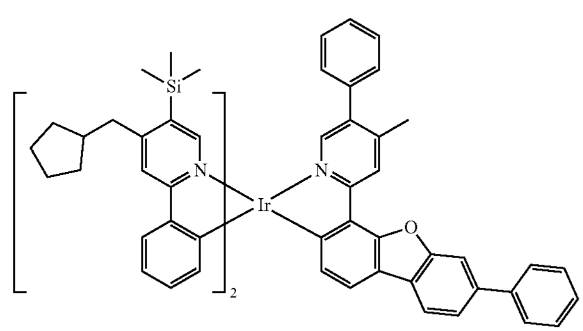

-continued
119
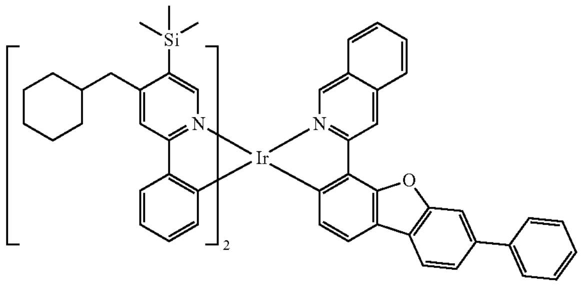
120
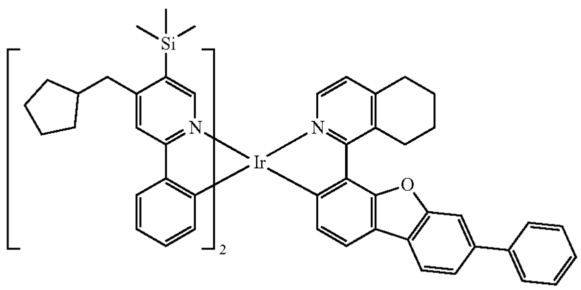
121
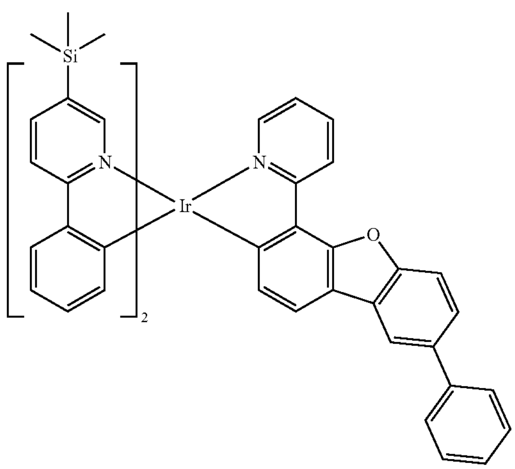
122
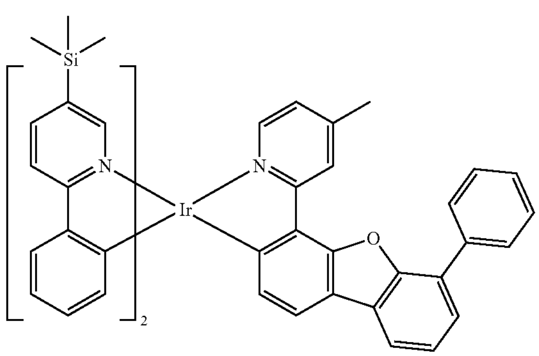
-continued
123
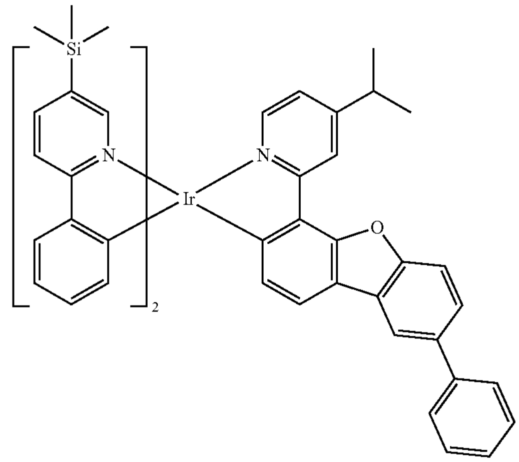
124
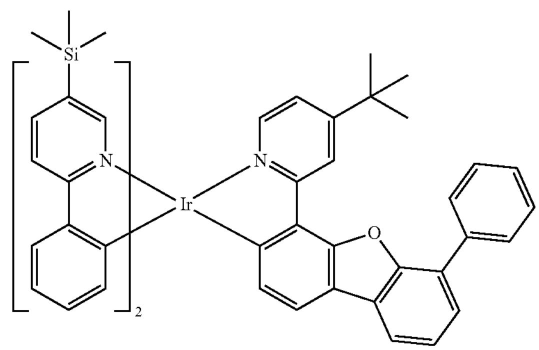
125
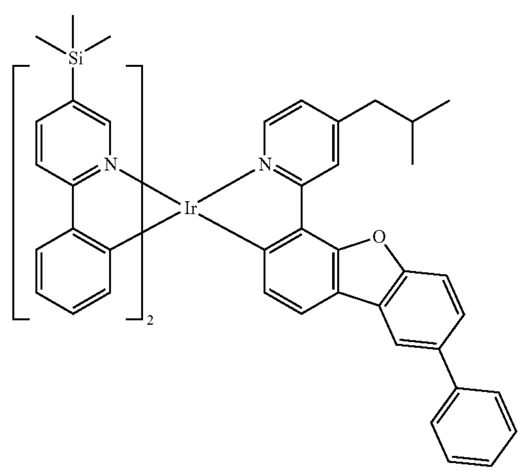

126
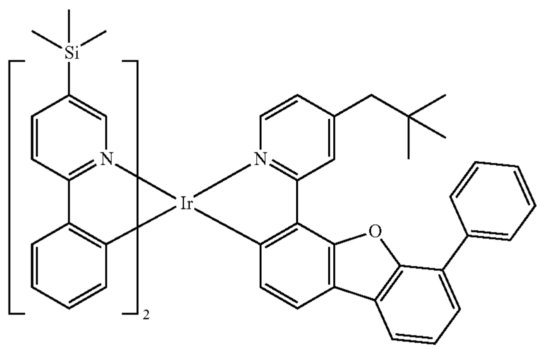
127
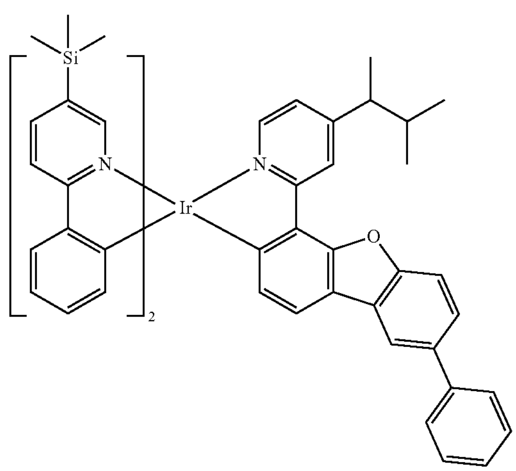
128
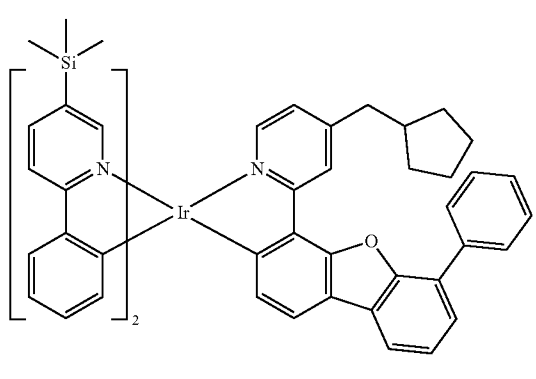
129
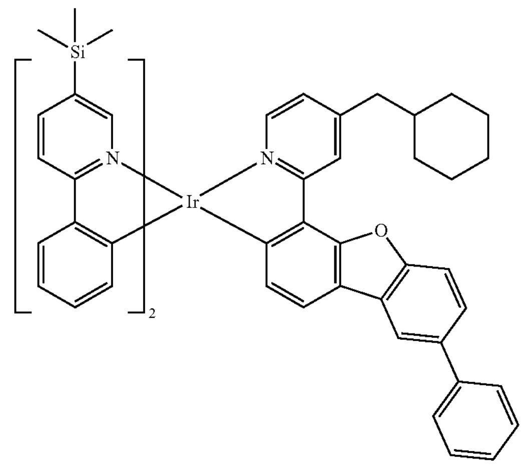
130
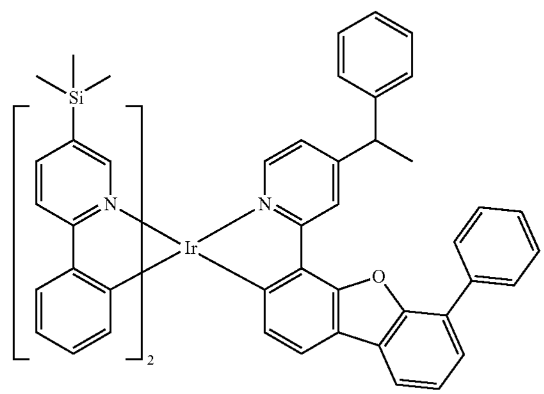
131
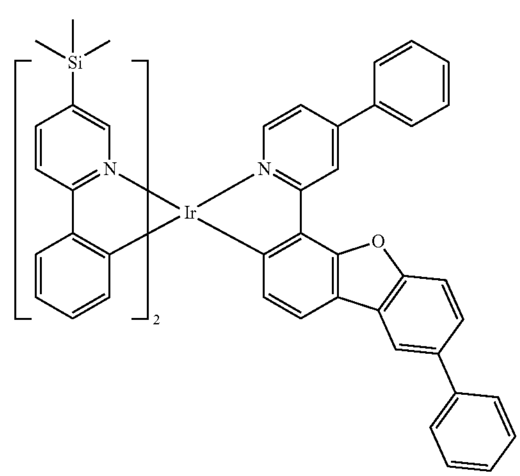

132
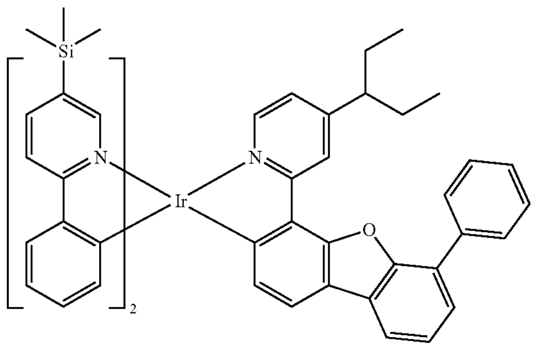
133
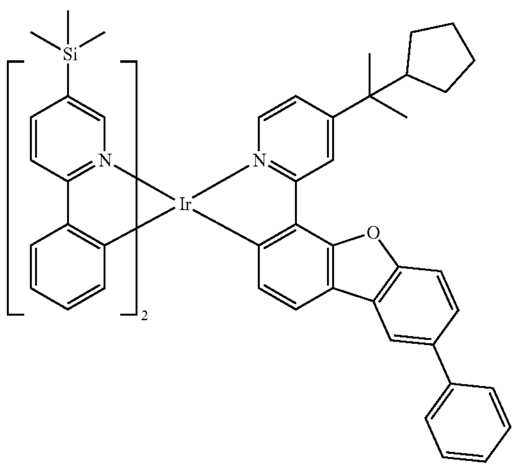
134
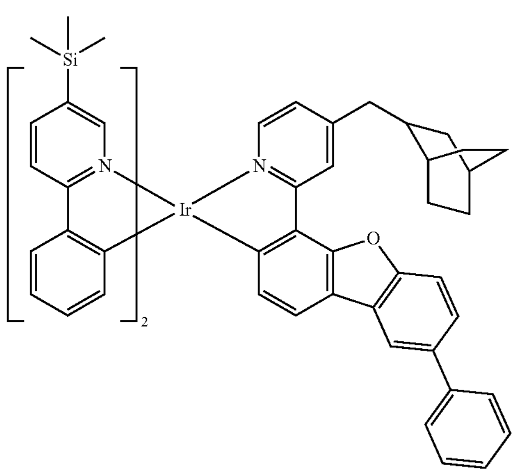
135
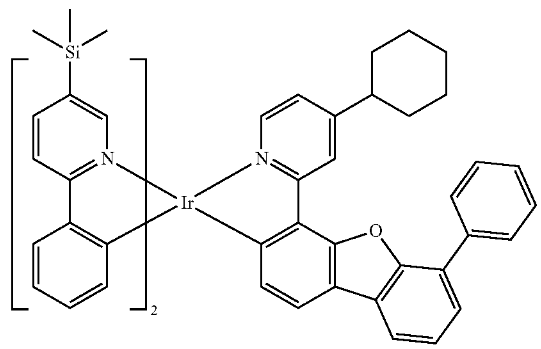
136
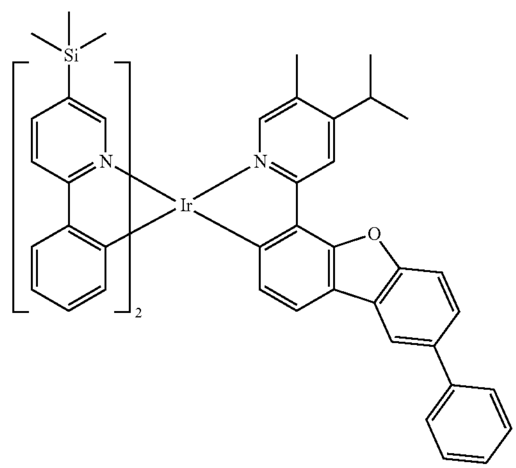
137
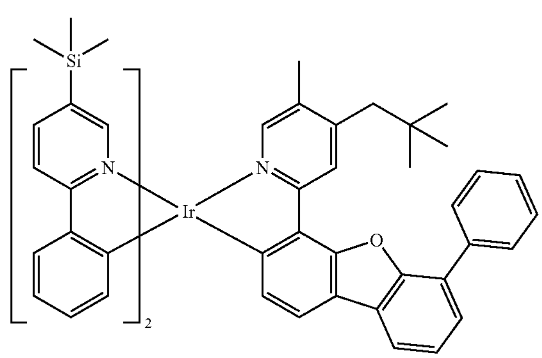

138
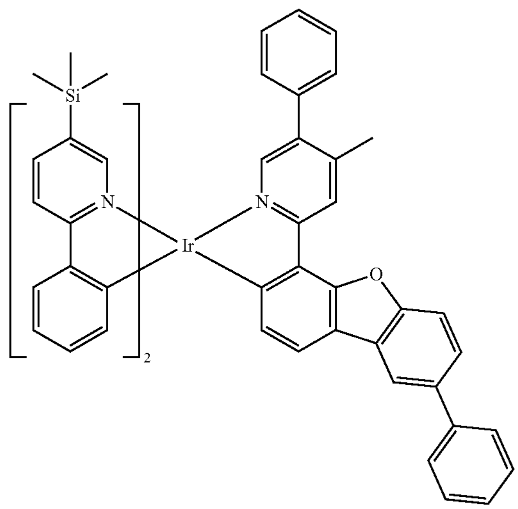
139
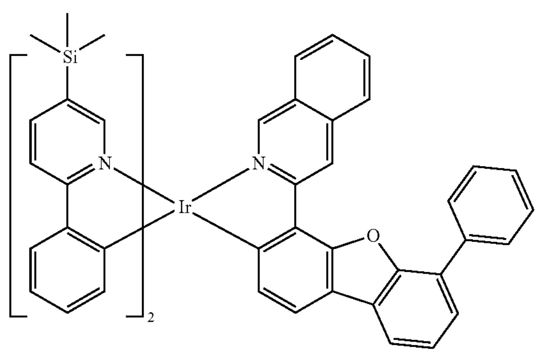
140
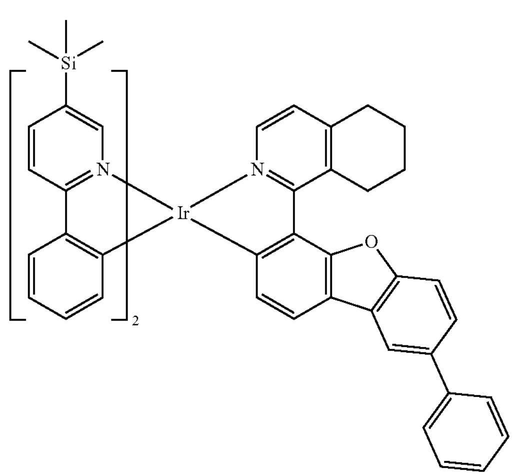
141
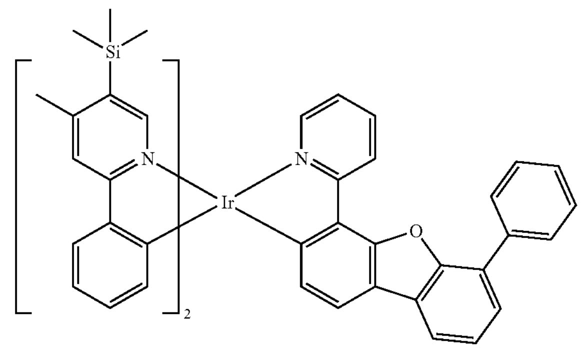
142
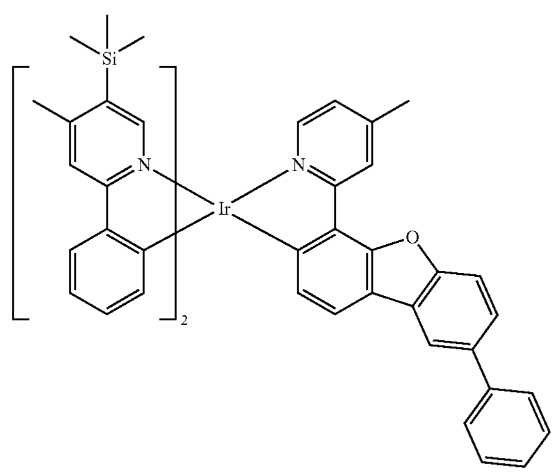
143
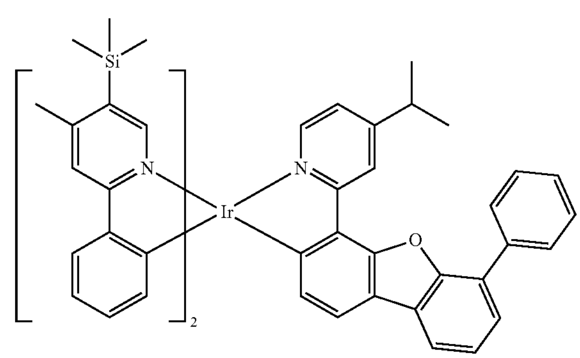

-continued
144
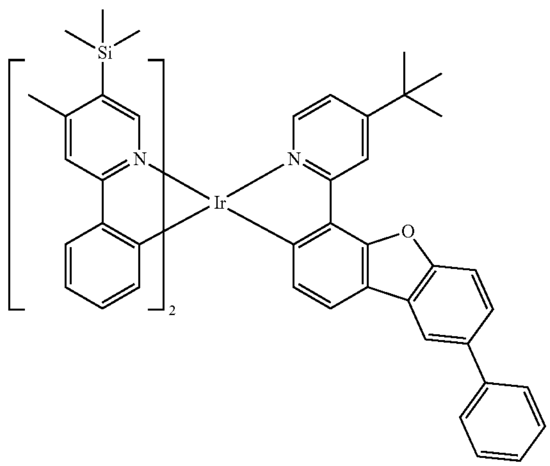
145
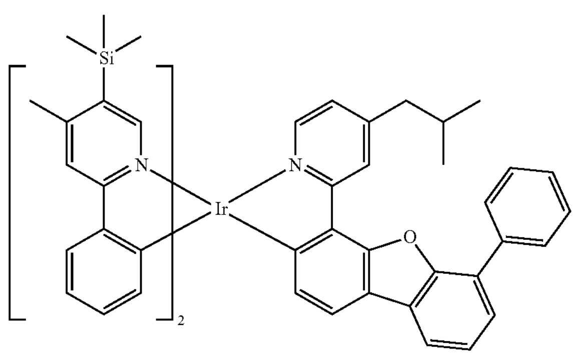
146
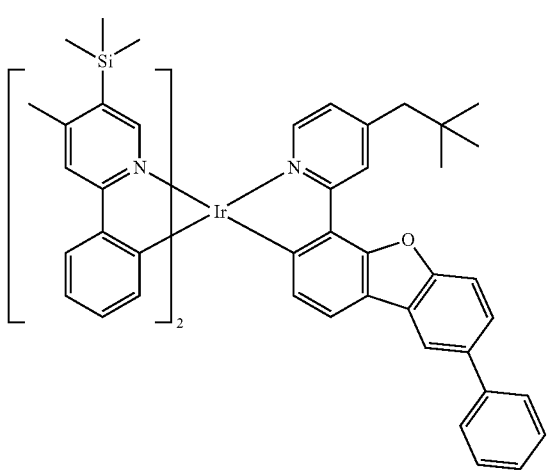
-continued
147
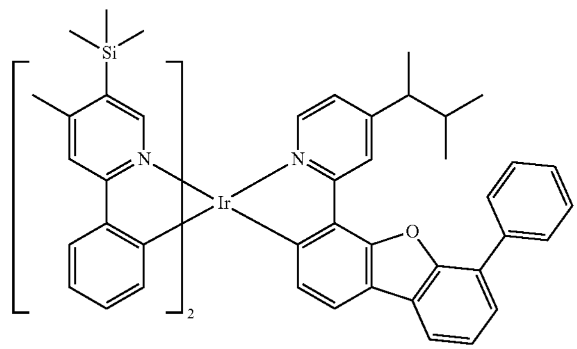
148
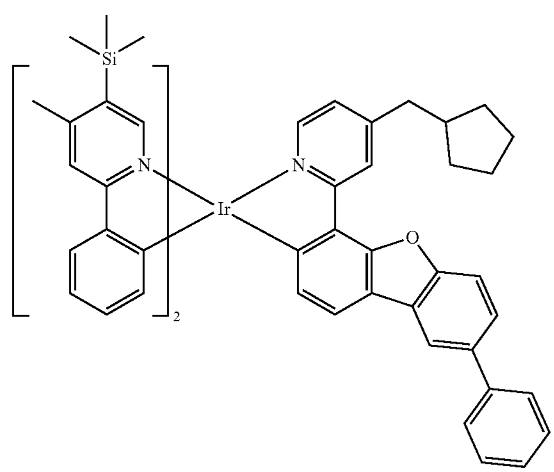
148
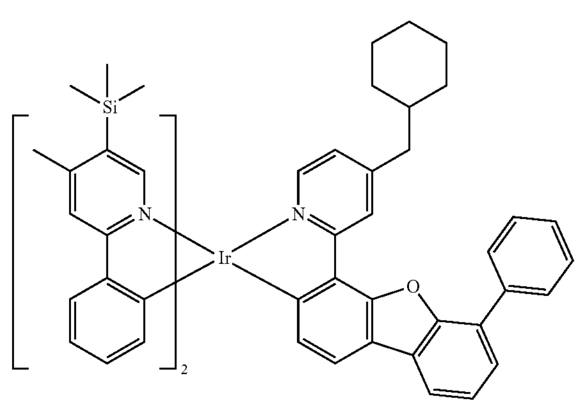

150
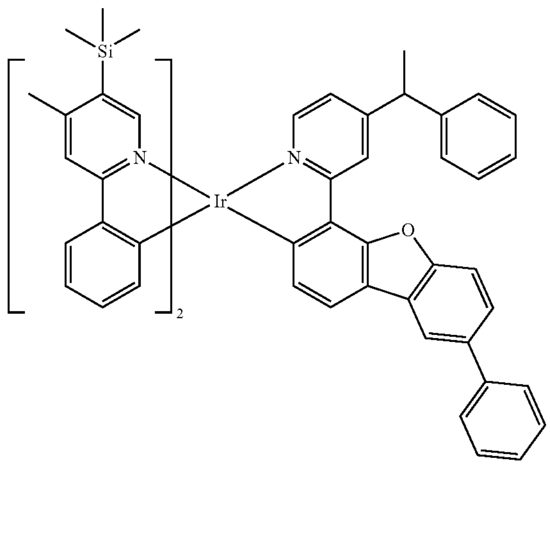
151
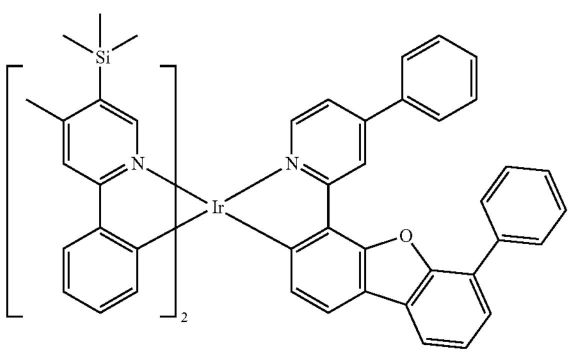
152
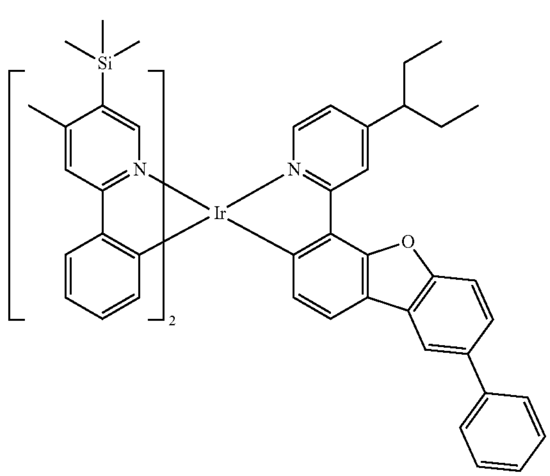
153
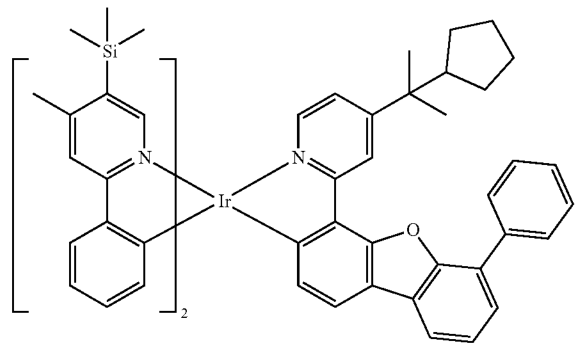
154
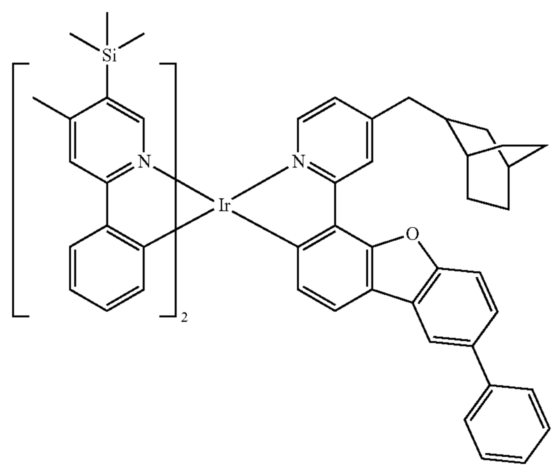
155
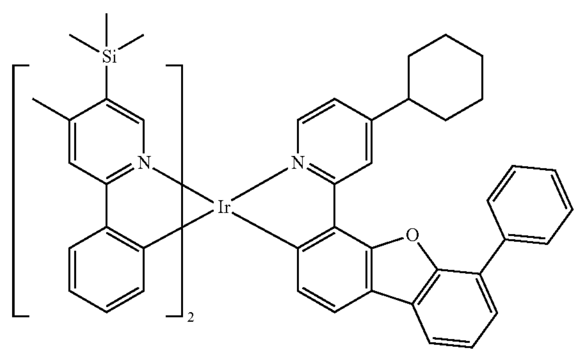

-continued
156
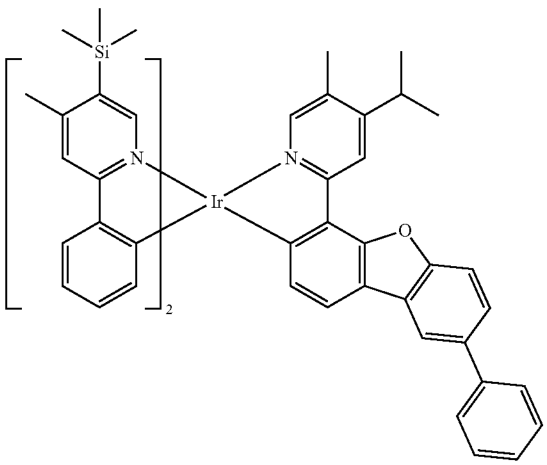
157
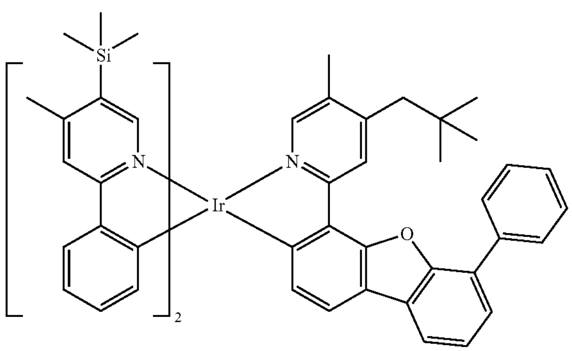
158
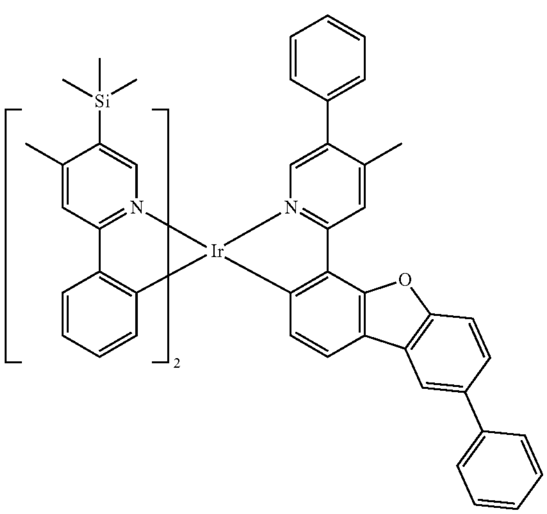
-continued
159
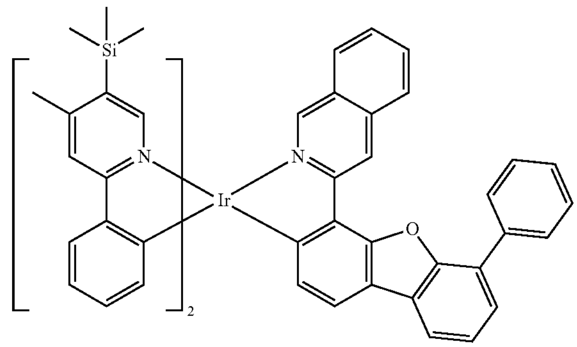
160
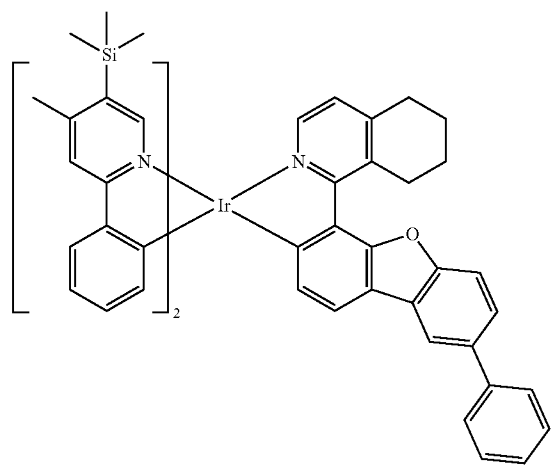
161
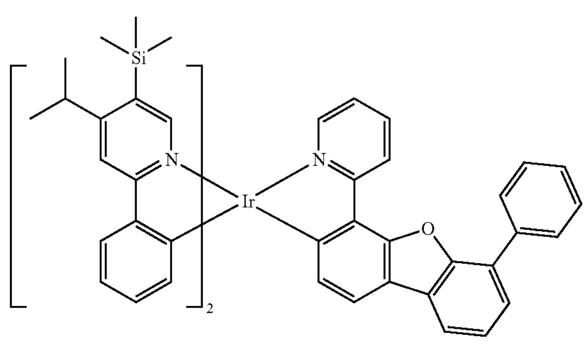

-continued
162
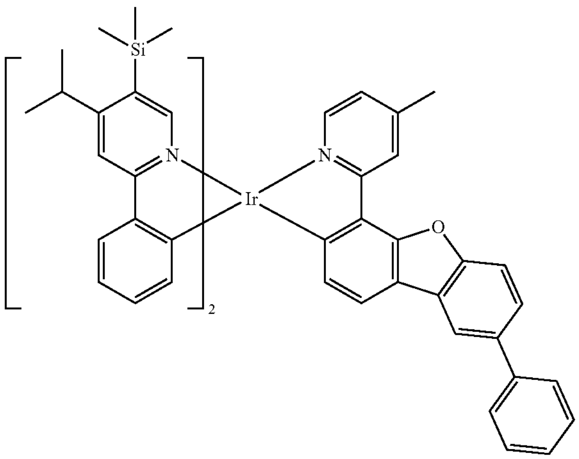
163
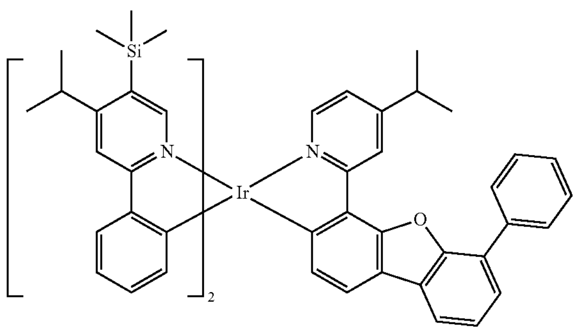
164
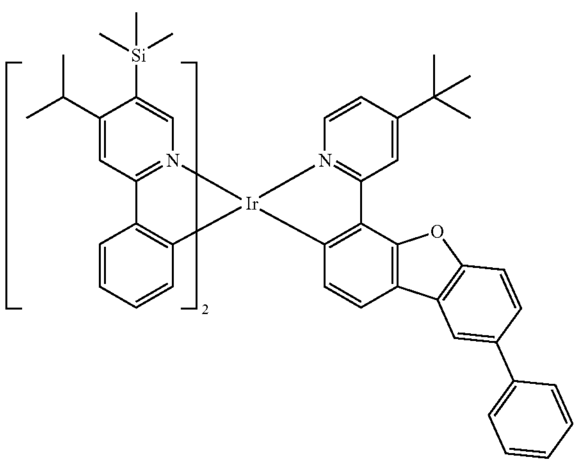
165
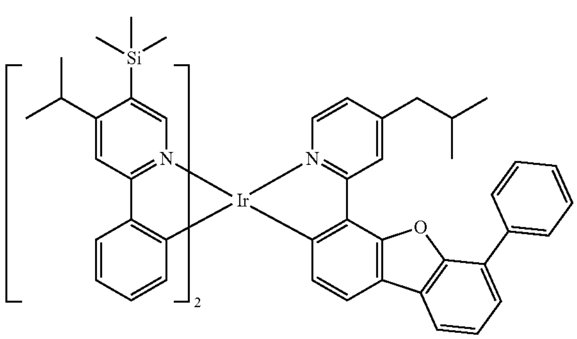
-continued
166
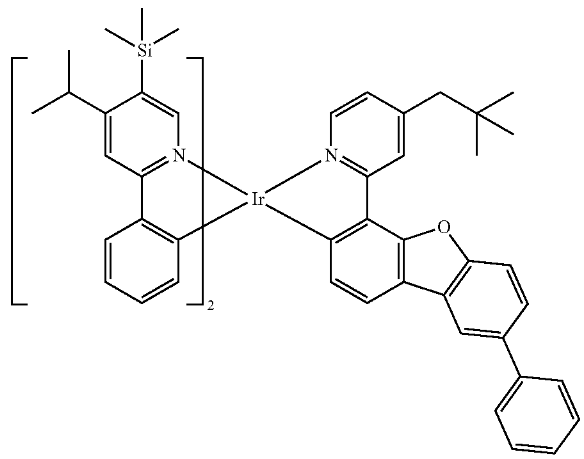
167
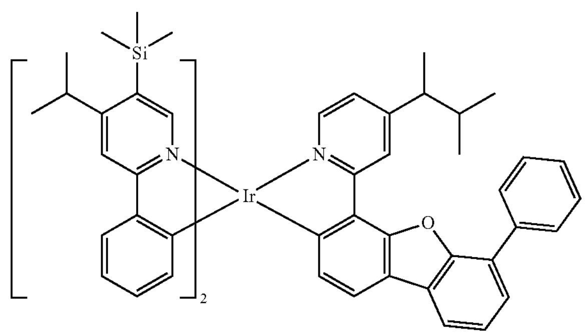
168
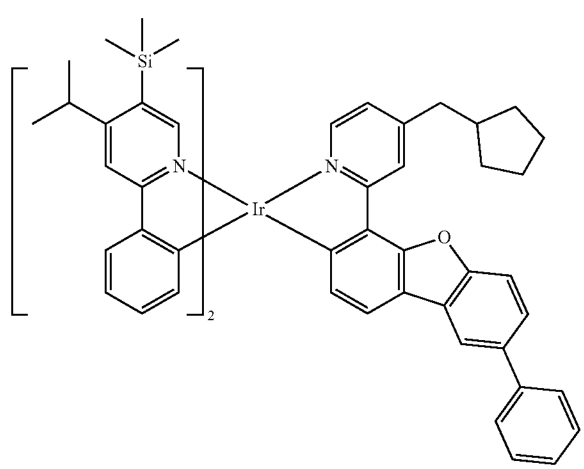

-continued
169
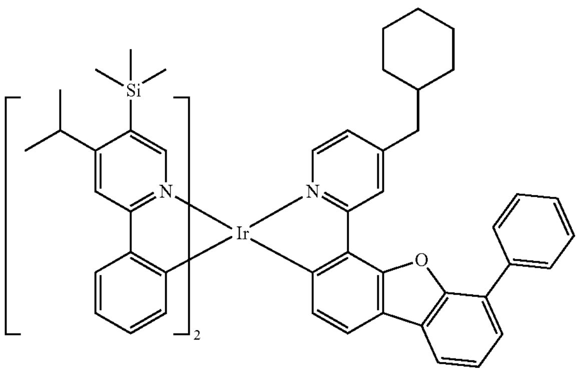
170
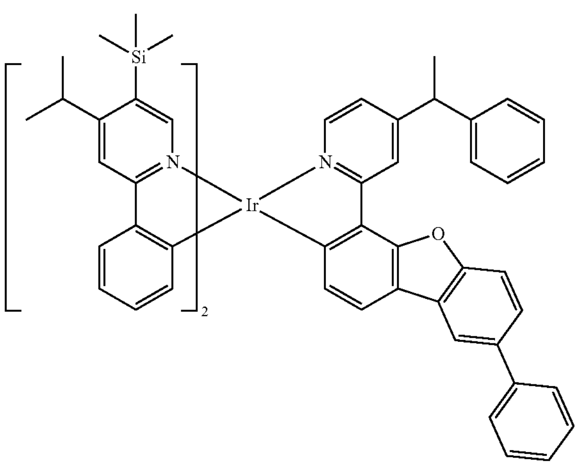
171
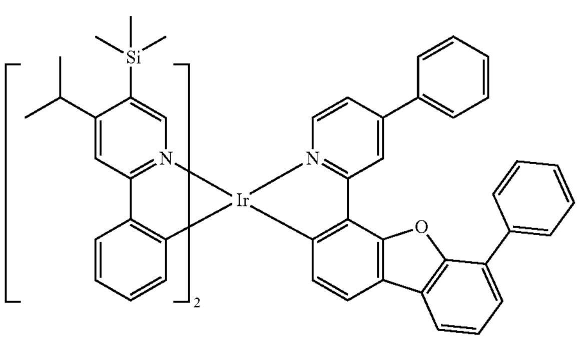
-continued
172
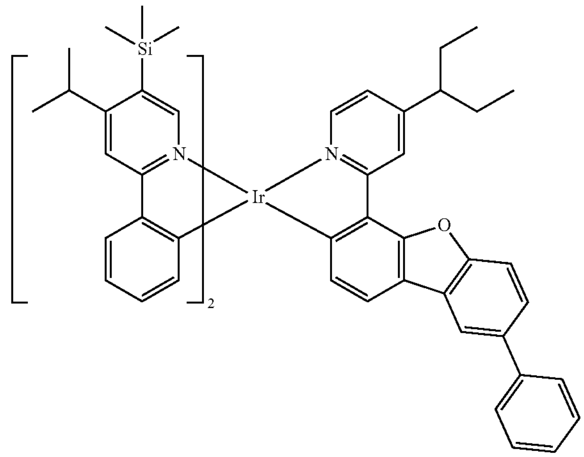
173
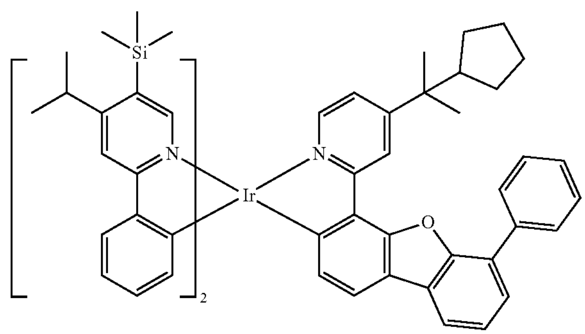
174
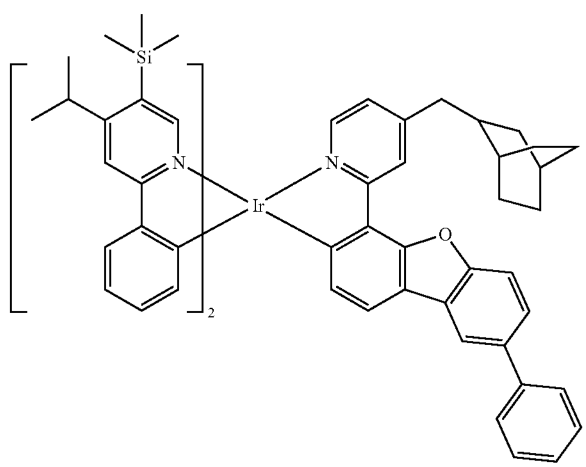
175
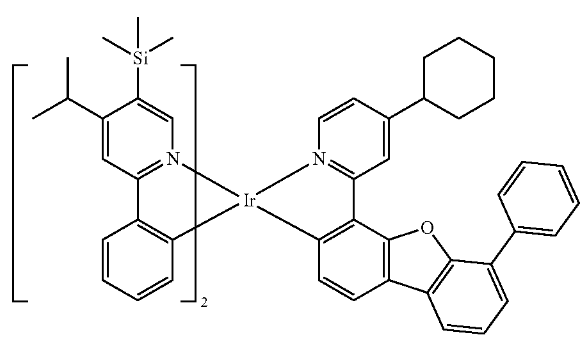

-continued
176
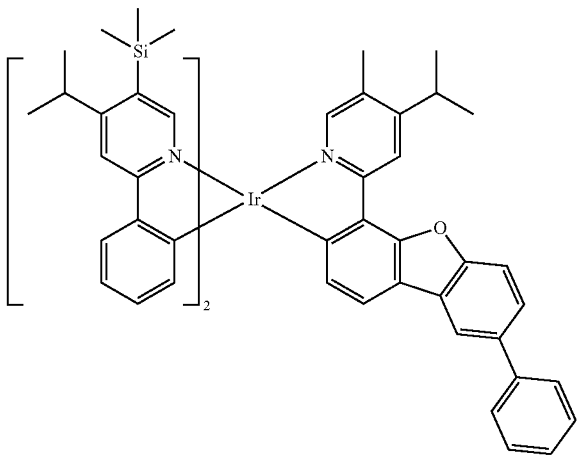
177
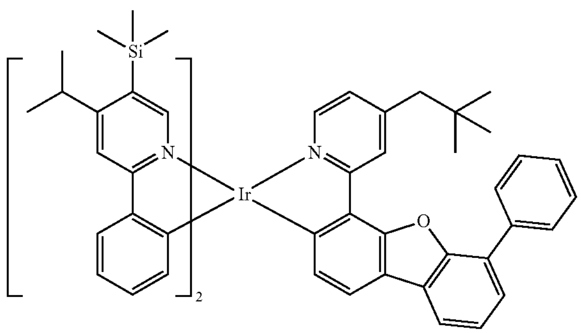
178
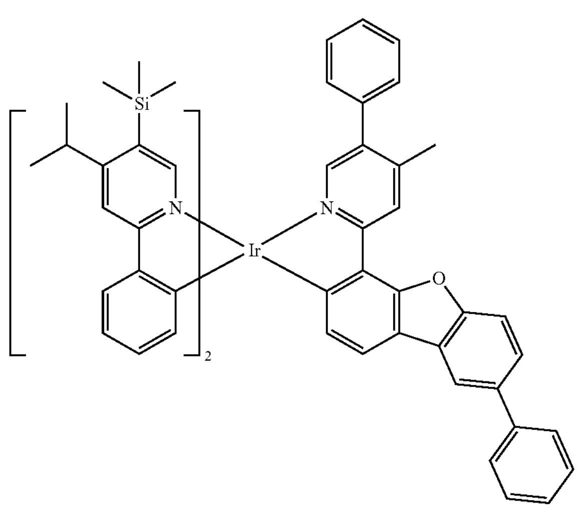
-continued
179
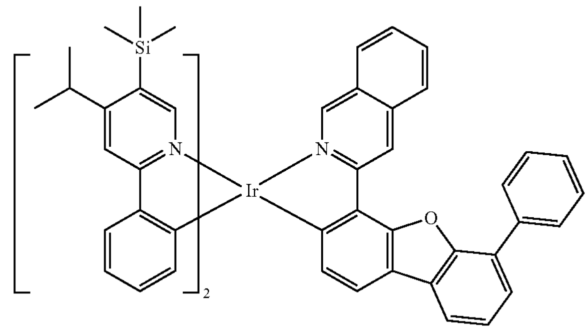
180
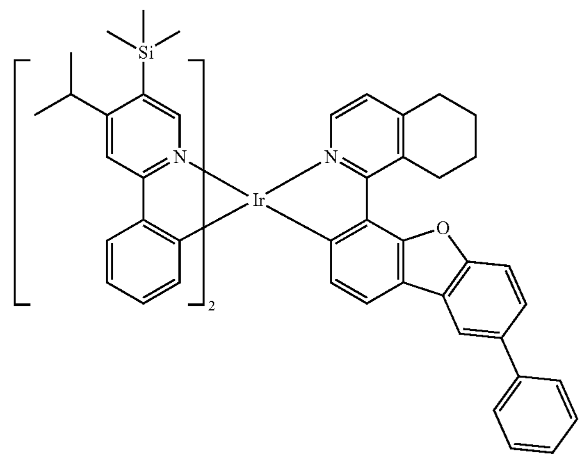
181
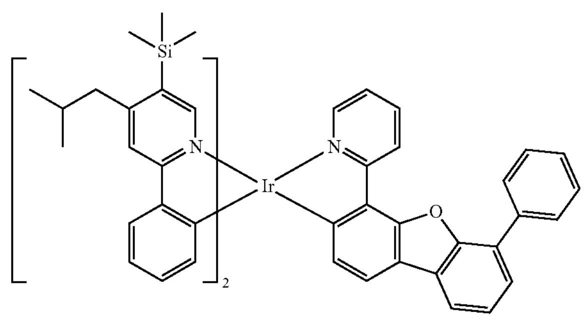
182
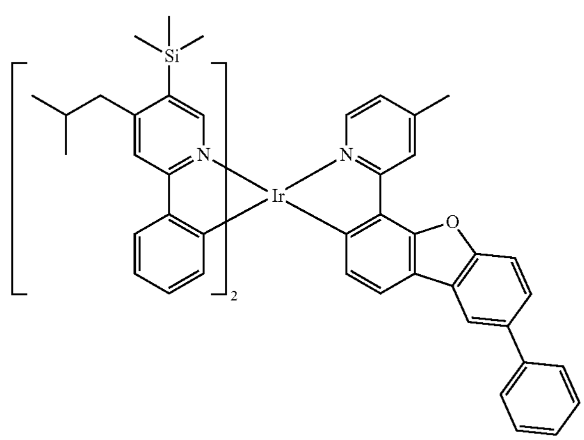

-continued
183
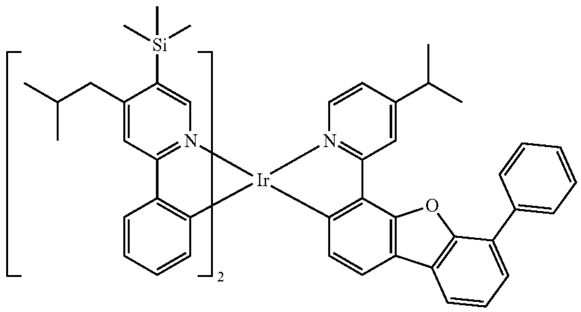
184
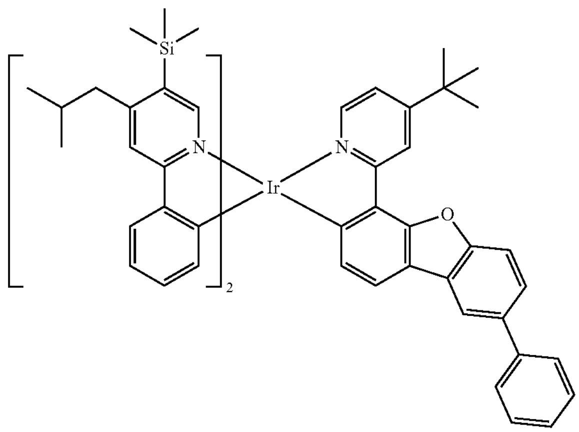
185
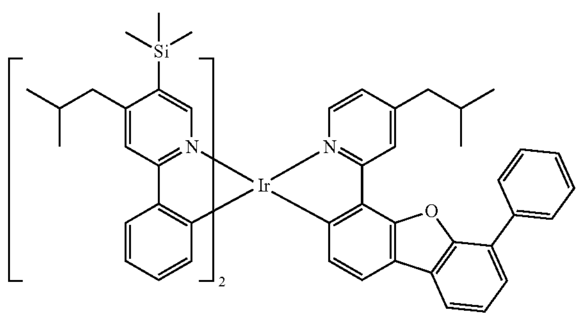
186
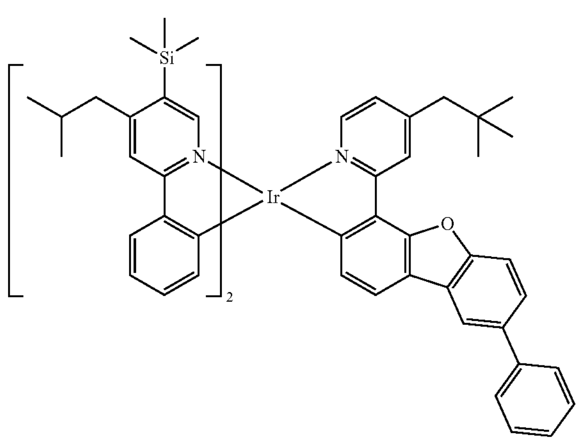
-continued
187
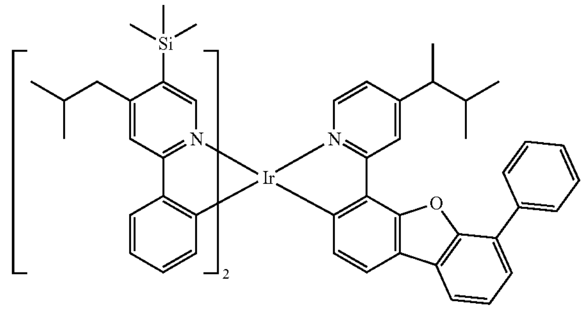
188
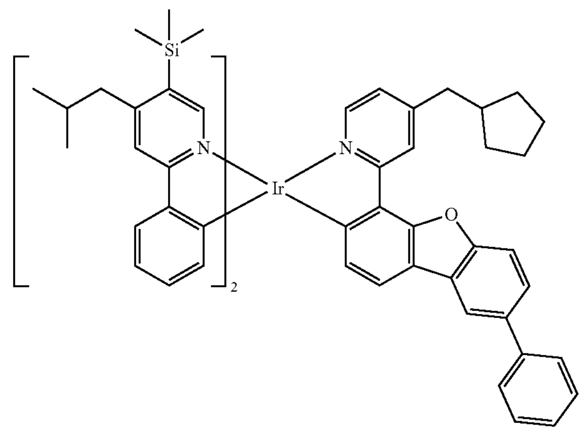
189
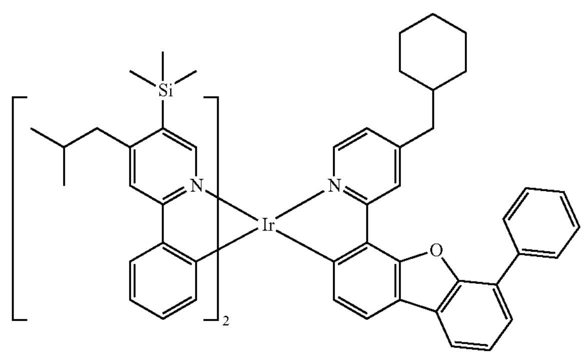
190
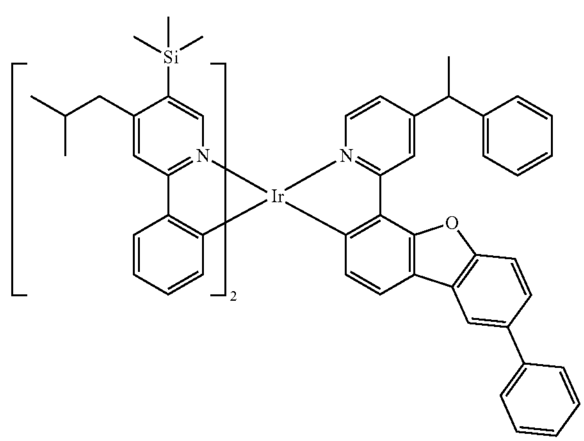

191
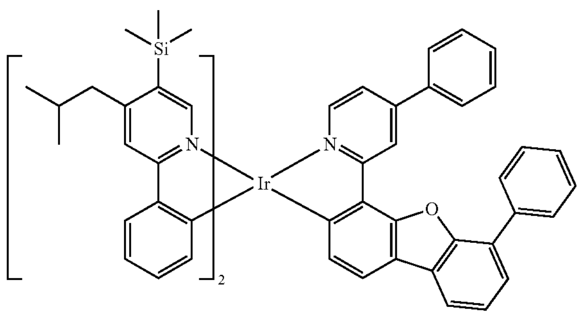
192
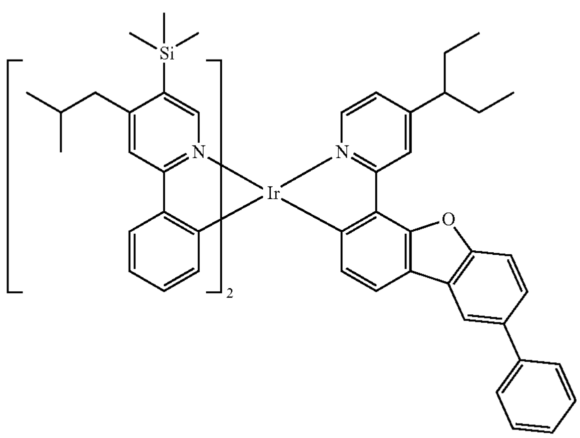
193
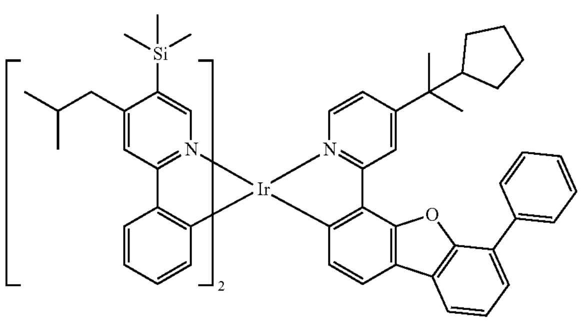
194
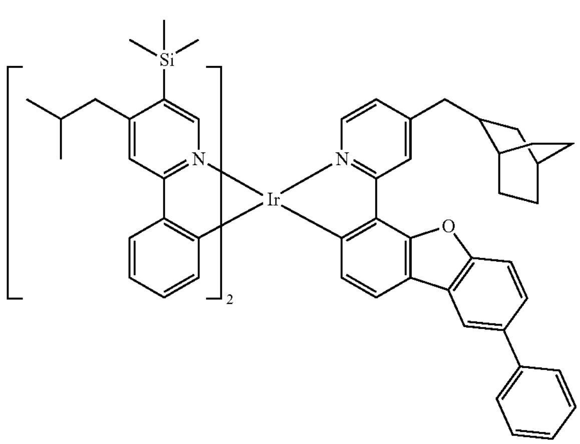
195
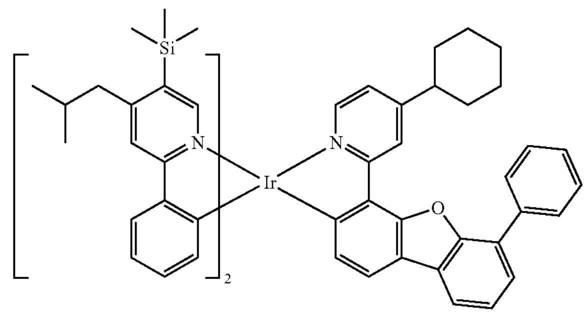
196
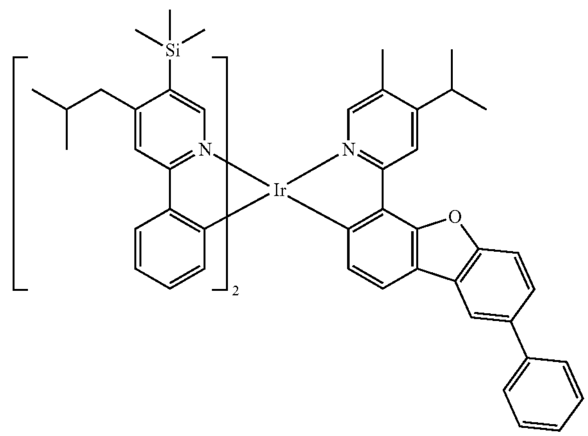
197
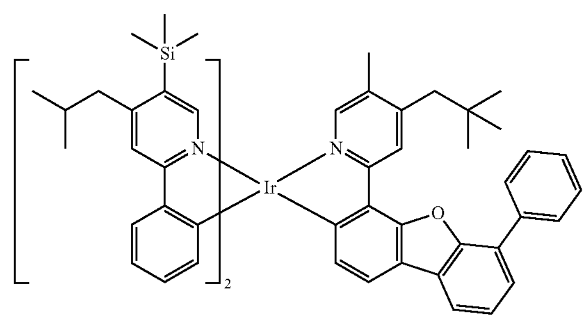
198
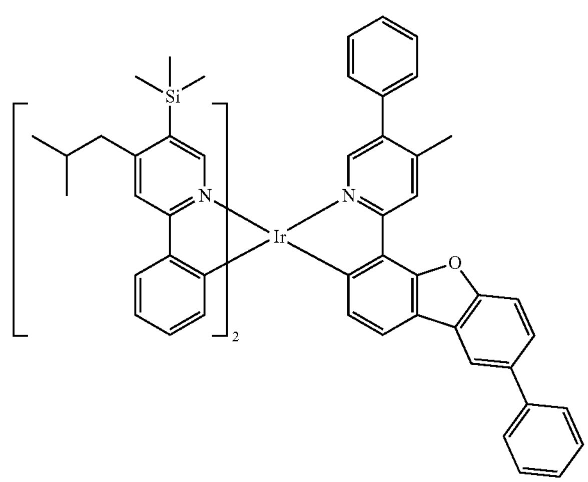

-continued
199
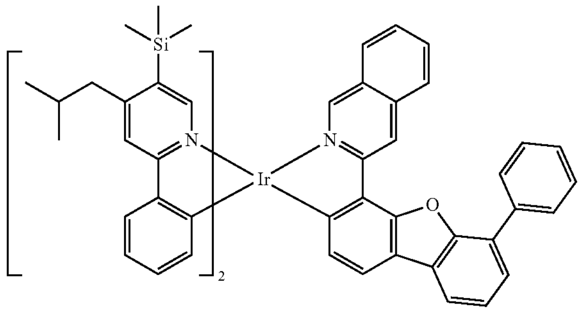
200
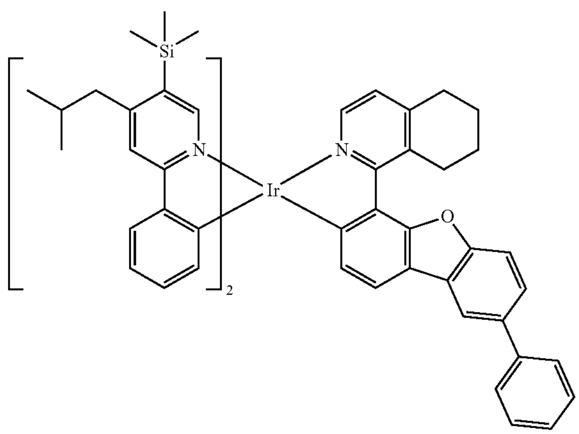
201
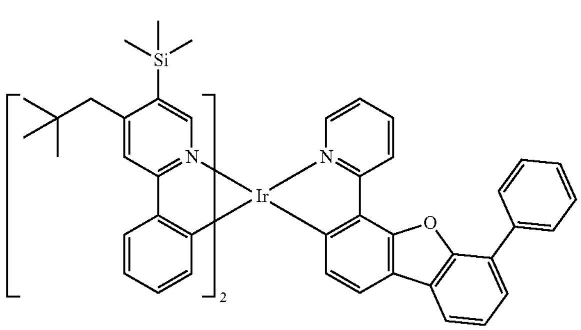
-continued
202
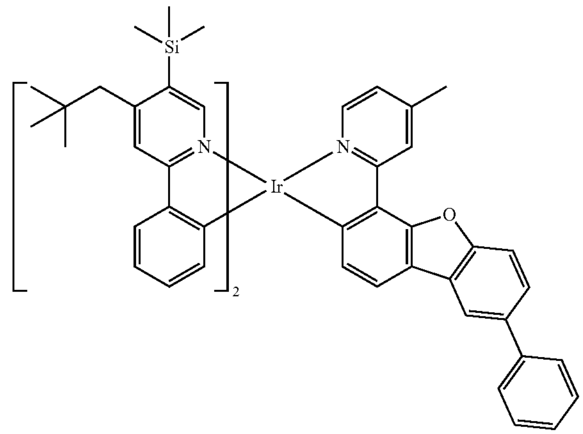
203
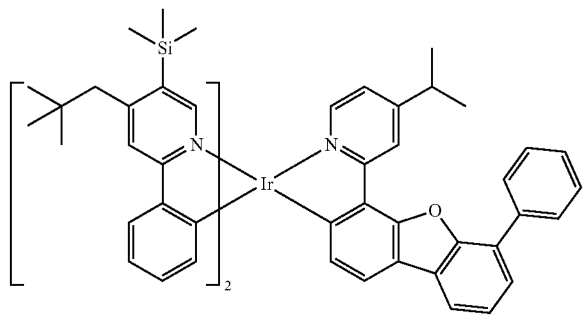
204
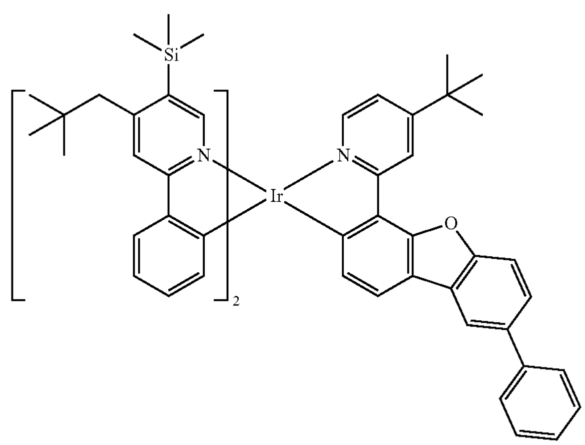
205
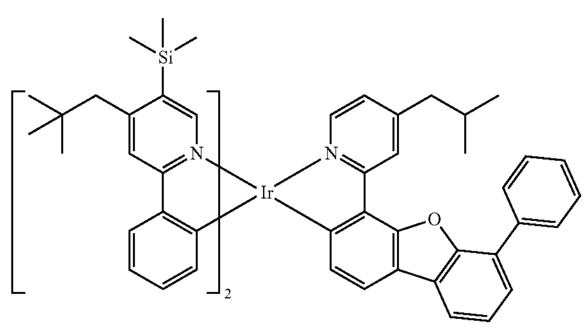

206
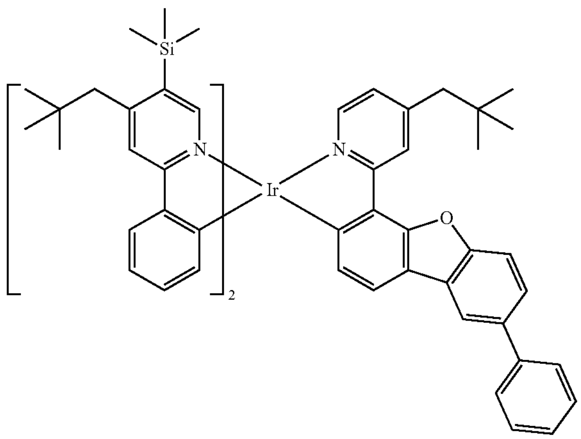
207
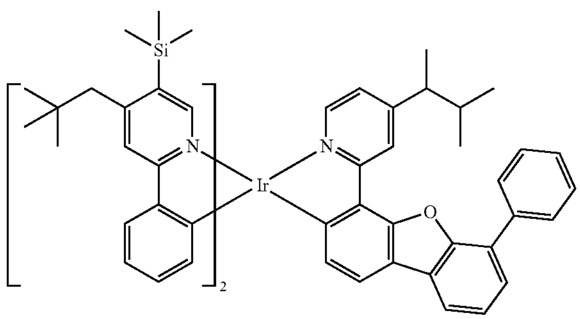
208
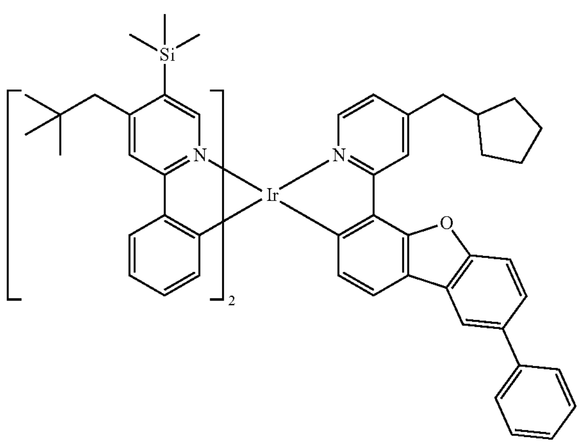
209
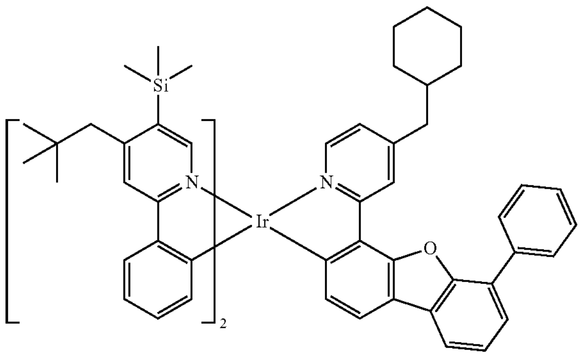
210
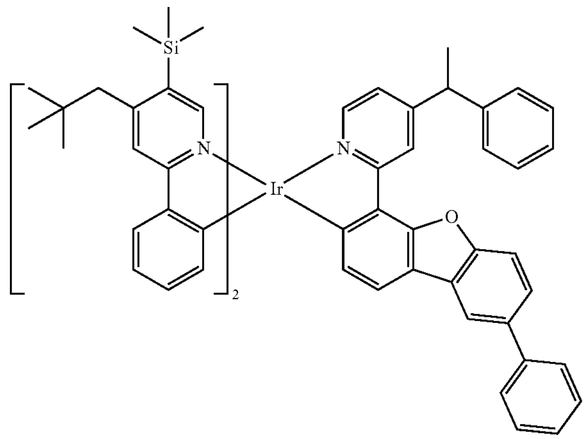
211
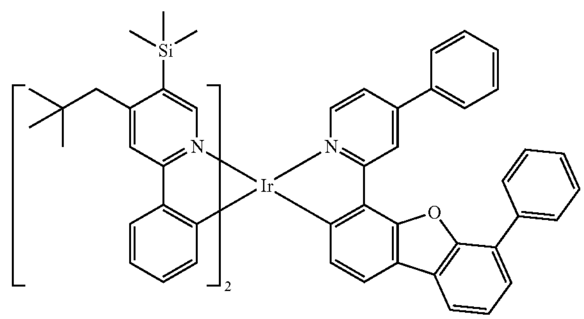
212
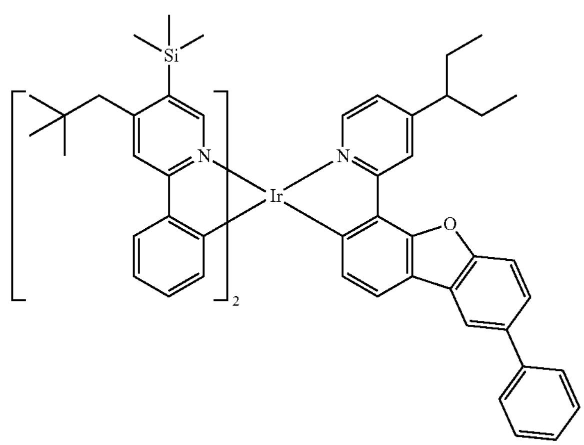
213
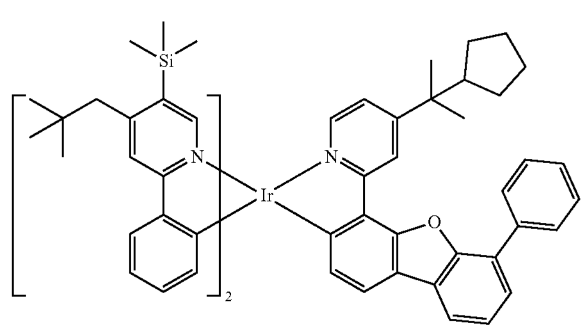

-continued
214
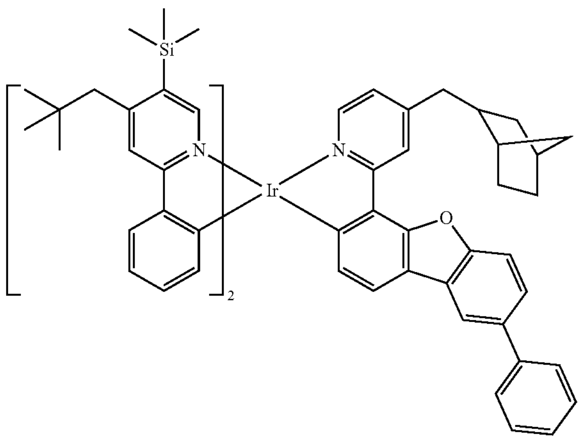
215
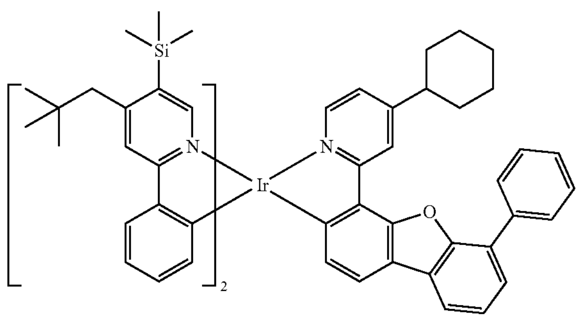
216
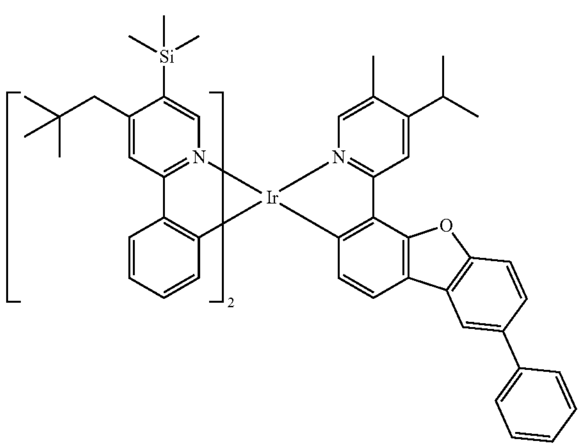
217
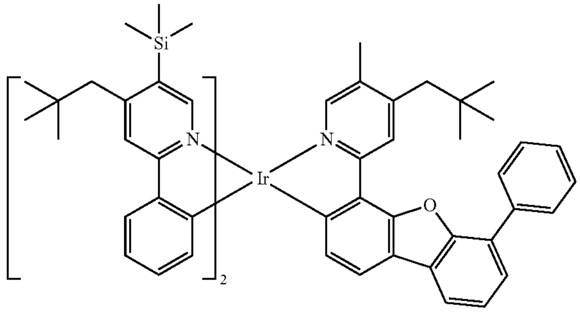
-continued
218
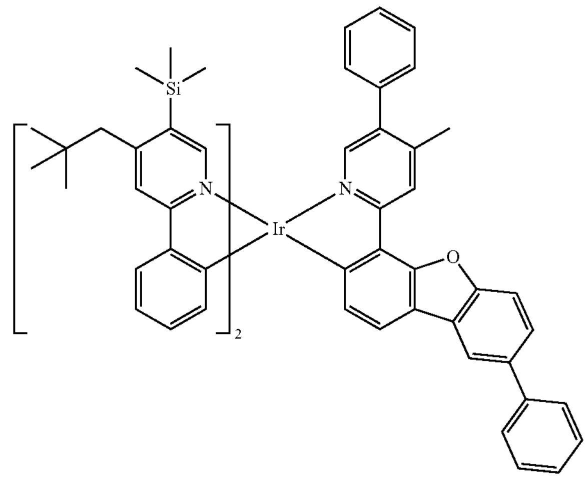
219
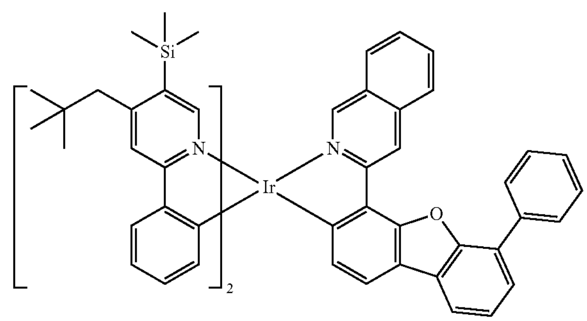
220
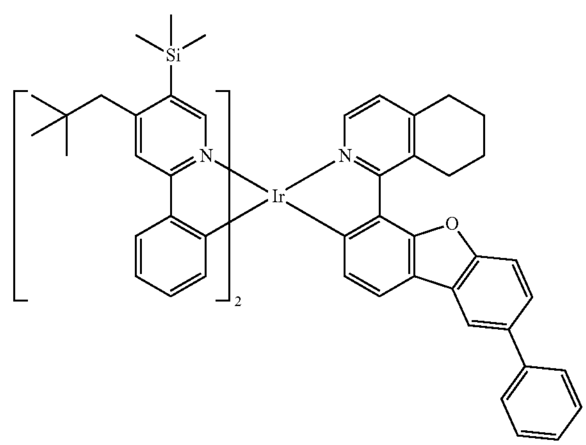
221
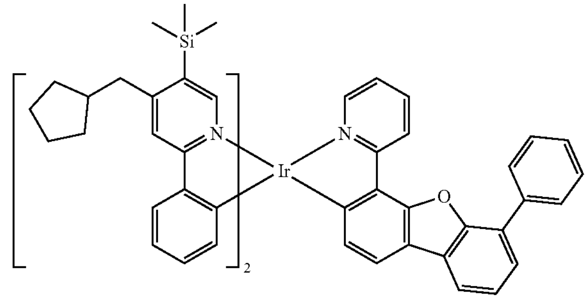

-continued
222
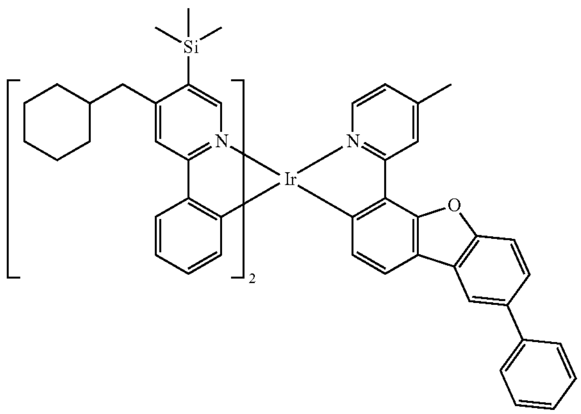
223
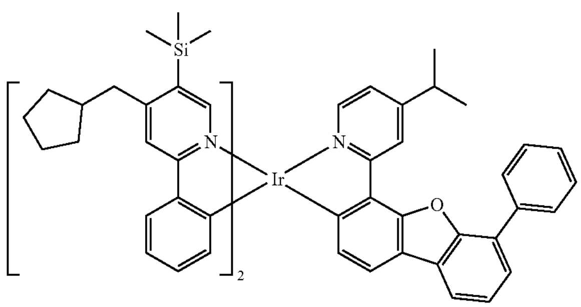
224
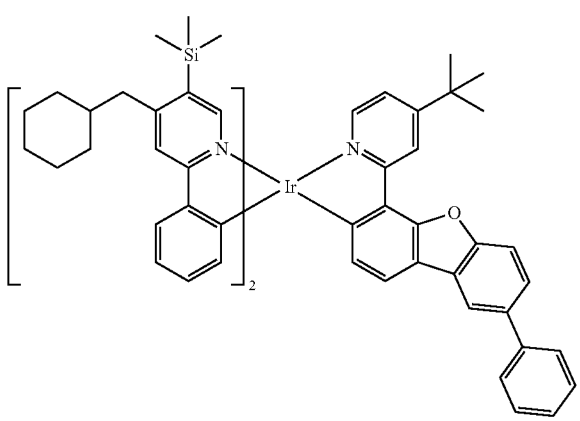
225
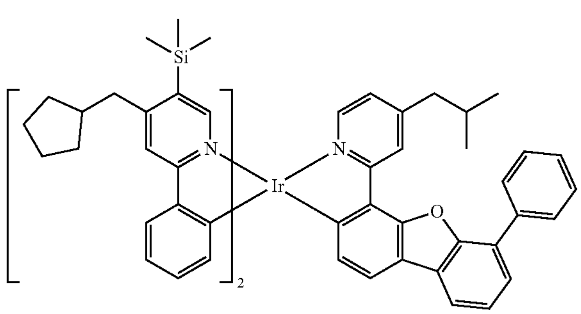
-continued
226
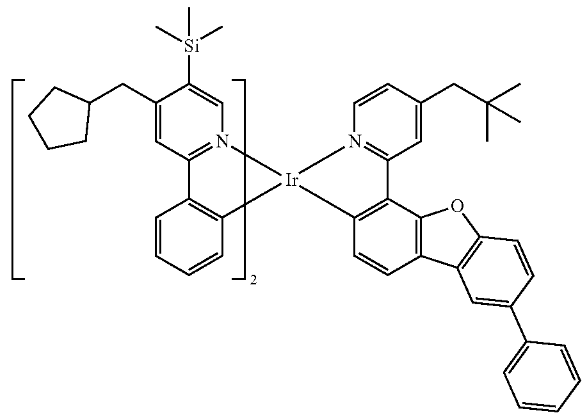
227
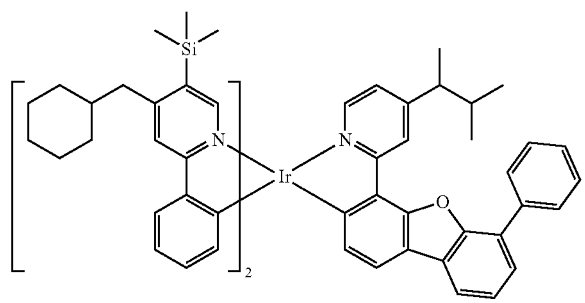
228
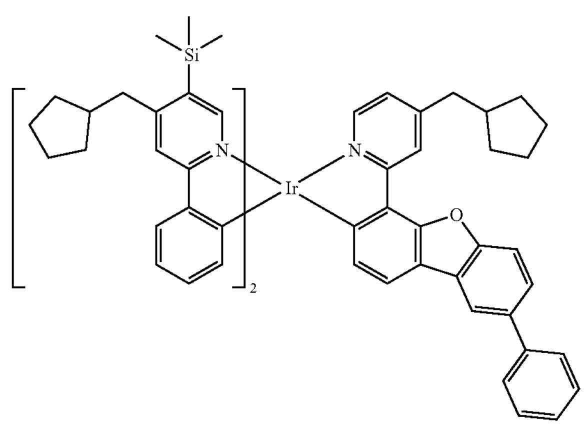
229
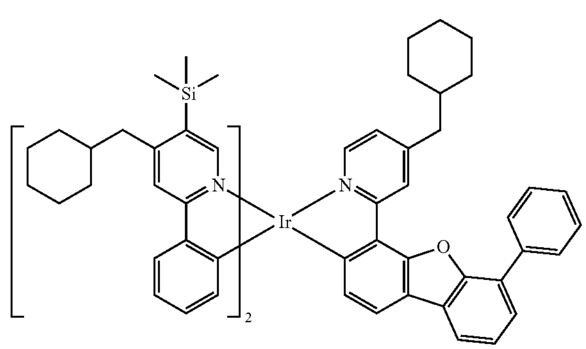

-continued
230
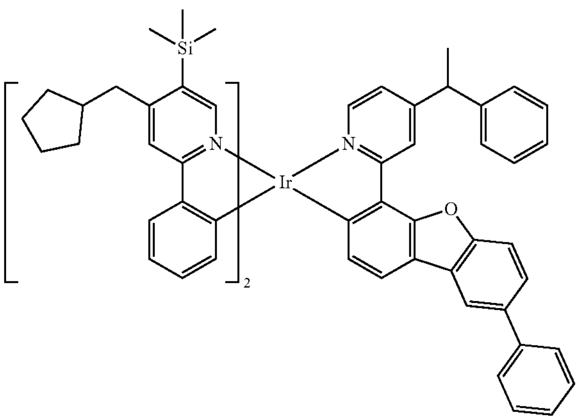
231
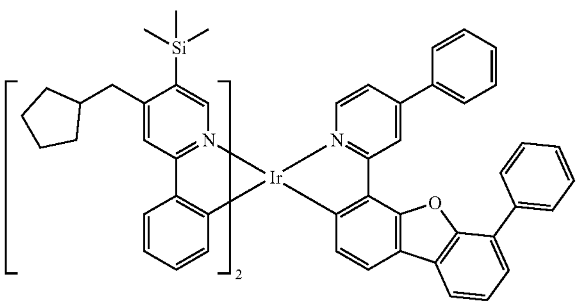
232
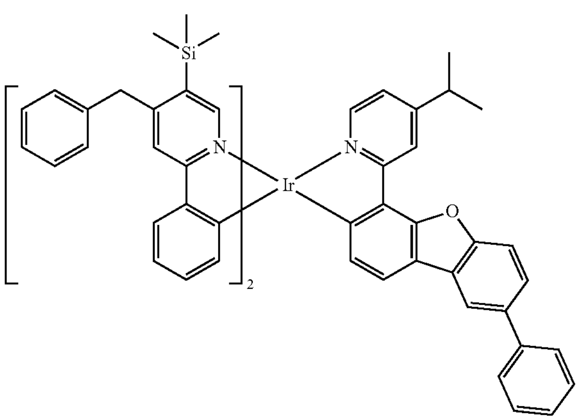
233
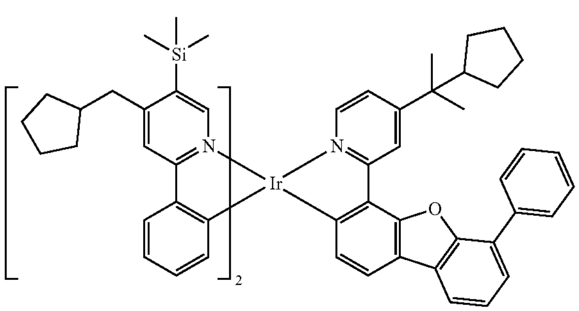
-continued
234
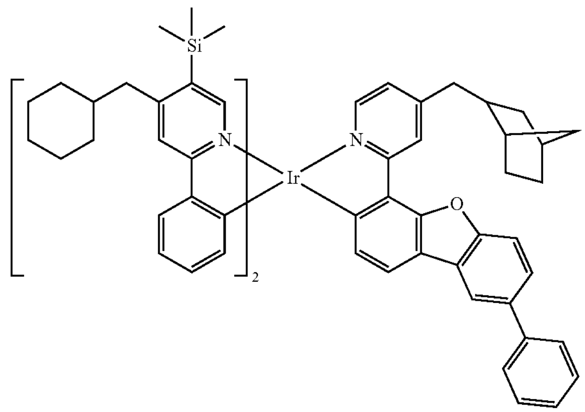
235
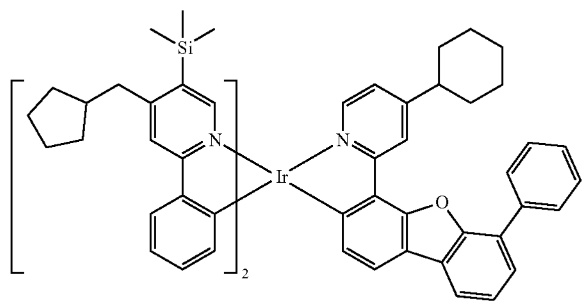
236
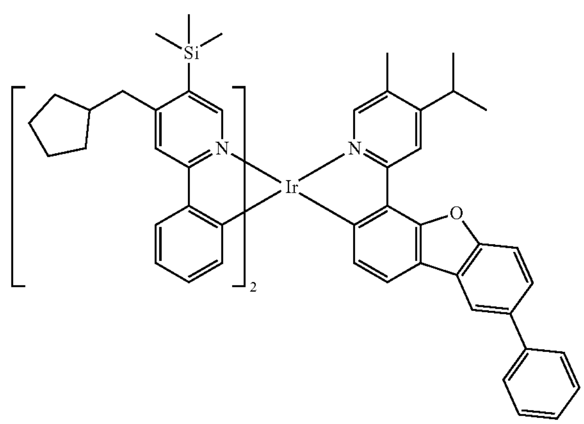
237
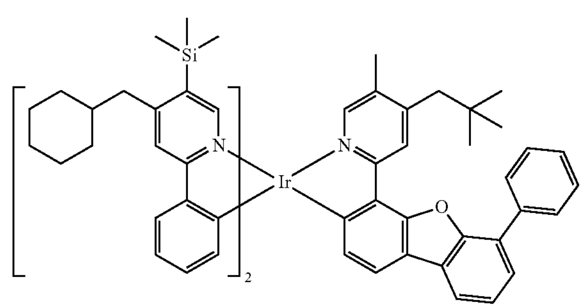

-continued
238
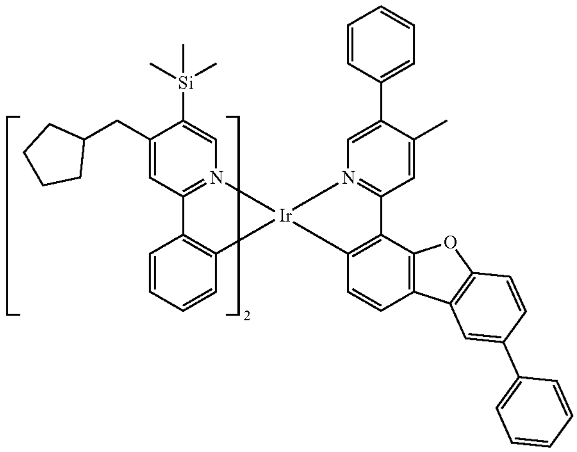
239
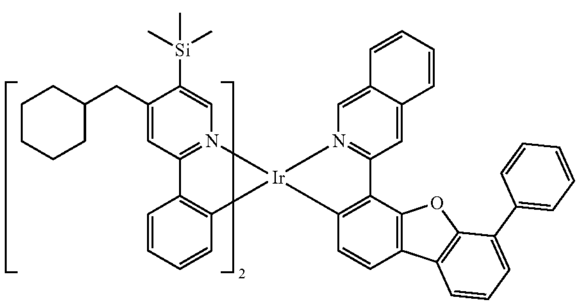
240
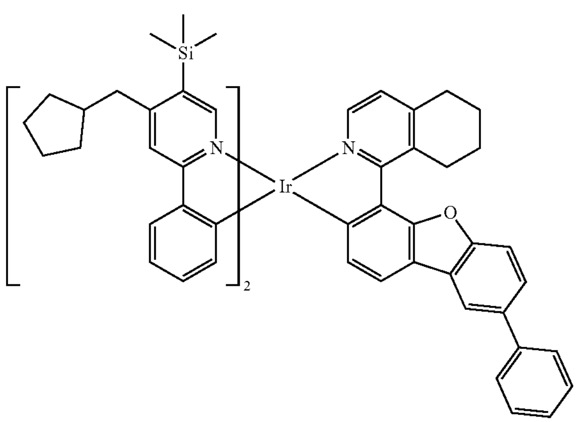
-continued
241
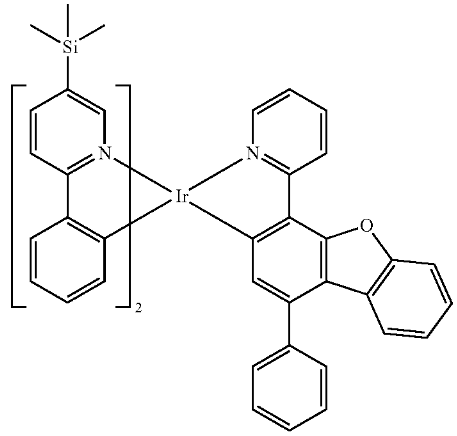
242
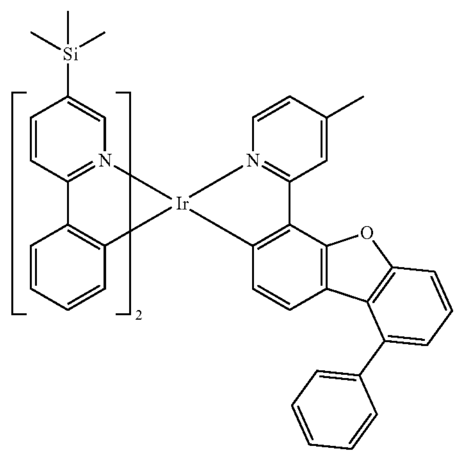
243
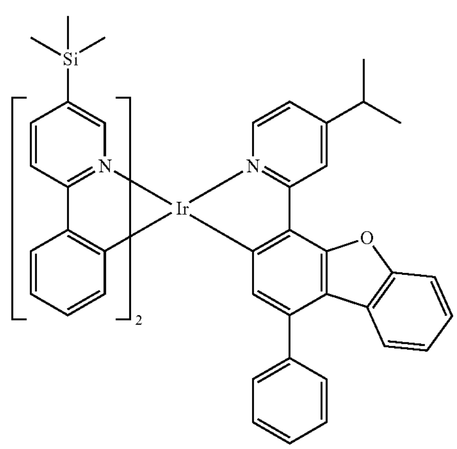

-continued
244
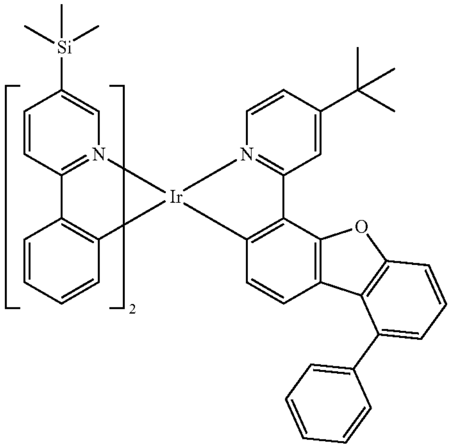
245
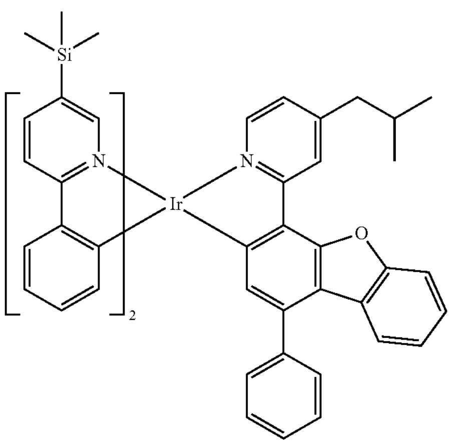
246
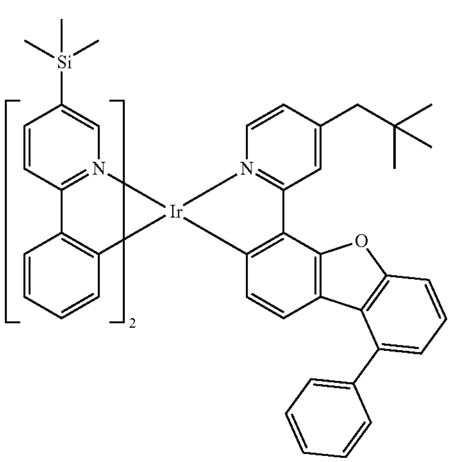
-continued
247
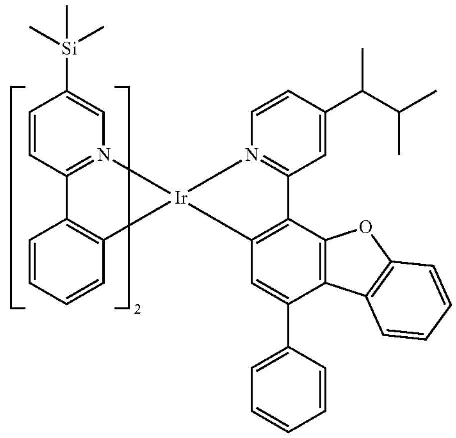
248
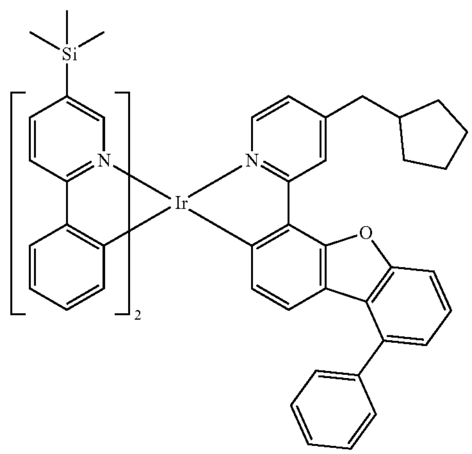
249
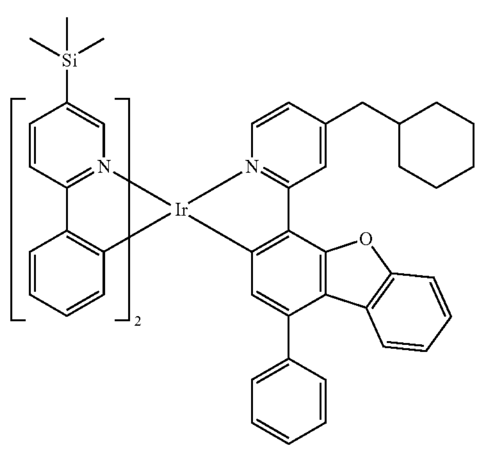

-continued
250
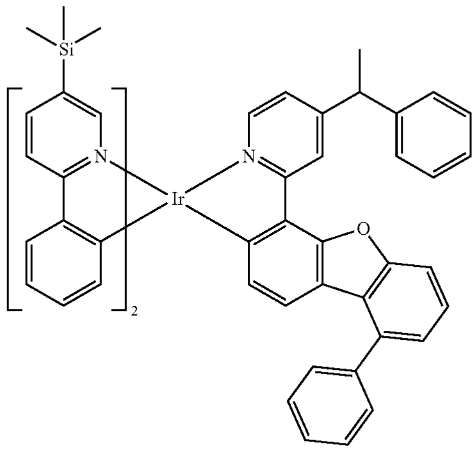
251
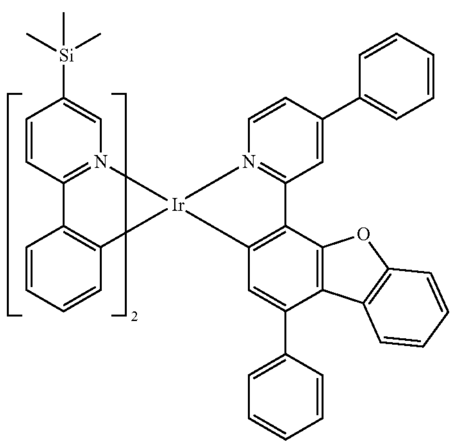
252
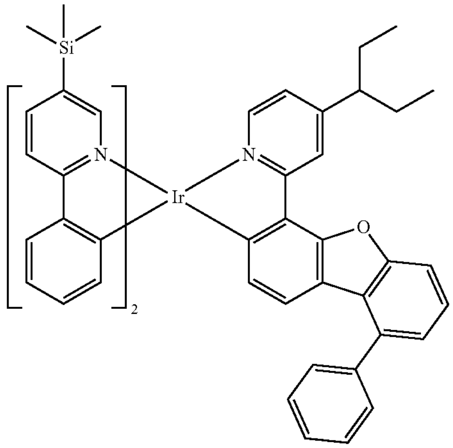
-continued
253
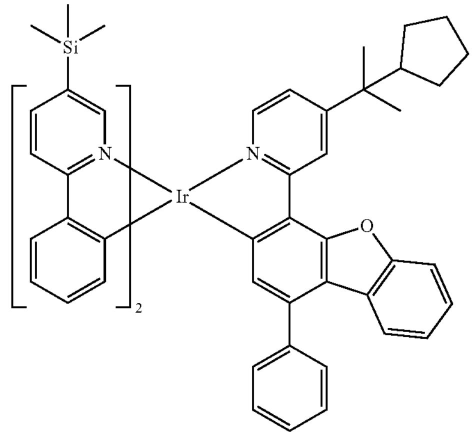
254
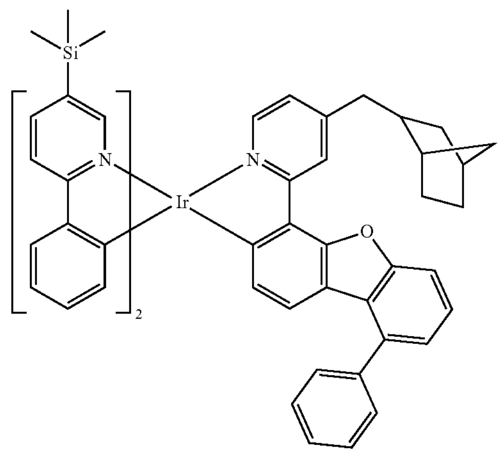
255
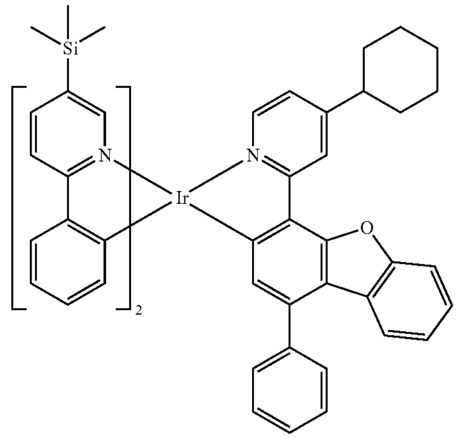

256
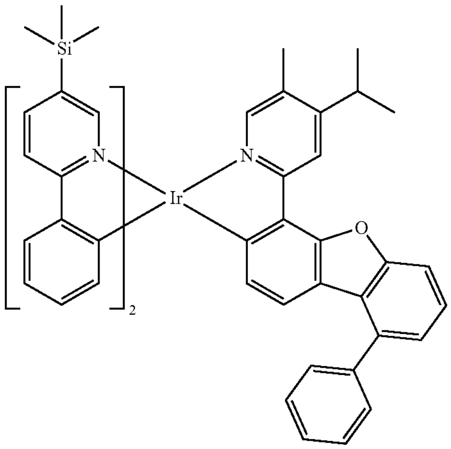
257
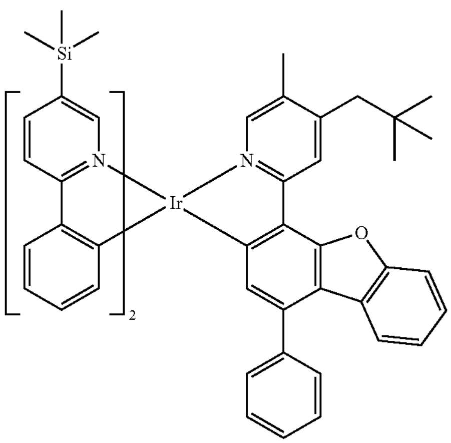
258
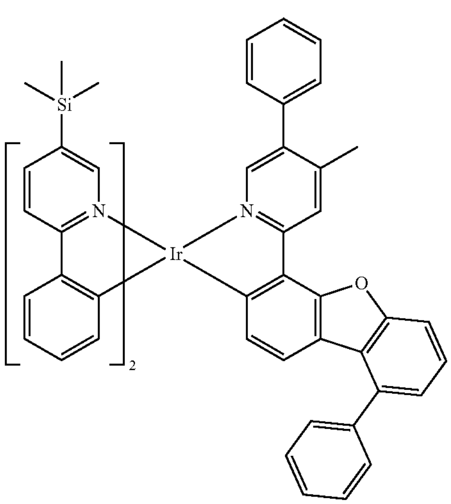
259
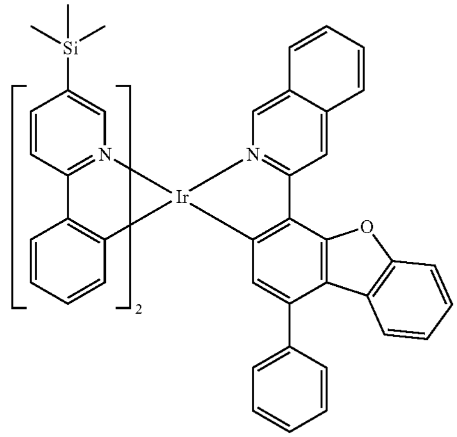
260
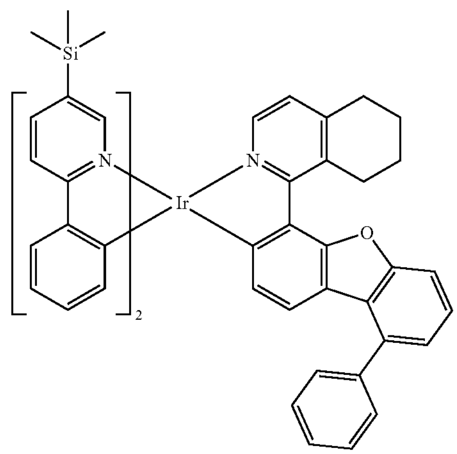
261
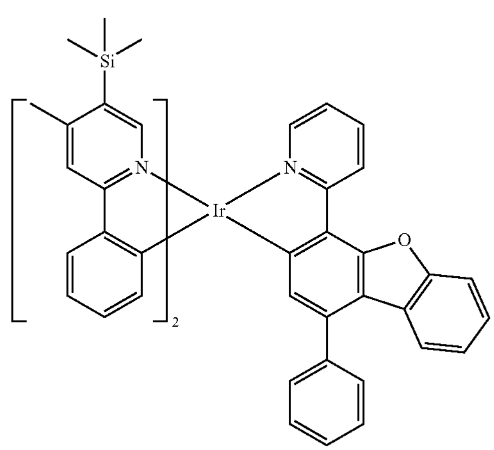

-continued
262
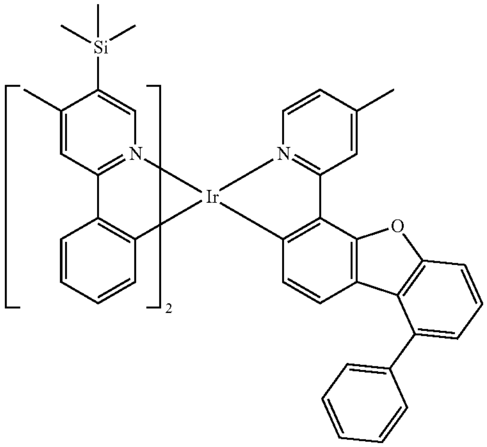
263
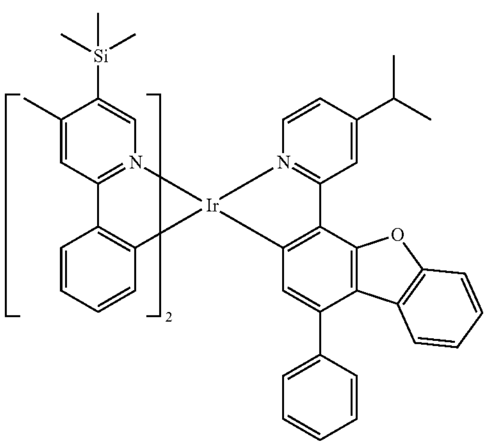
264
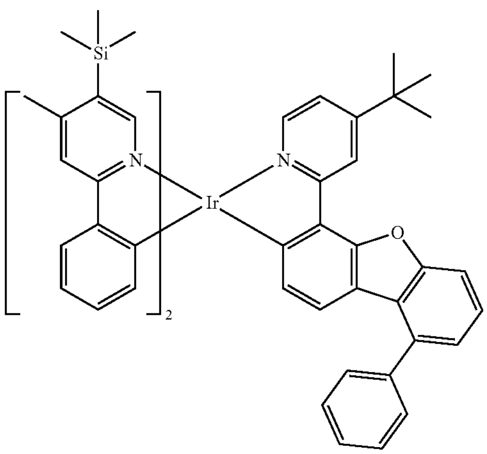
-continued
265
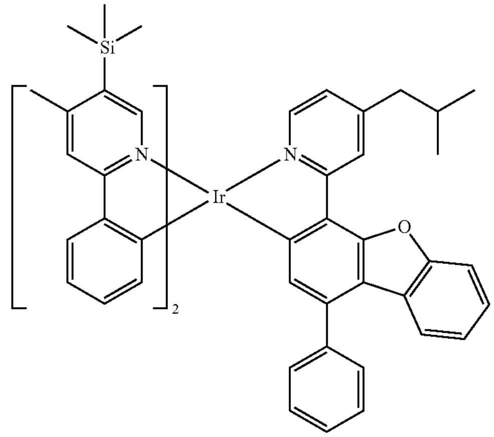
266
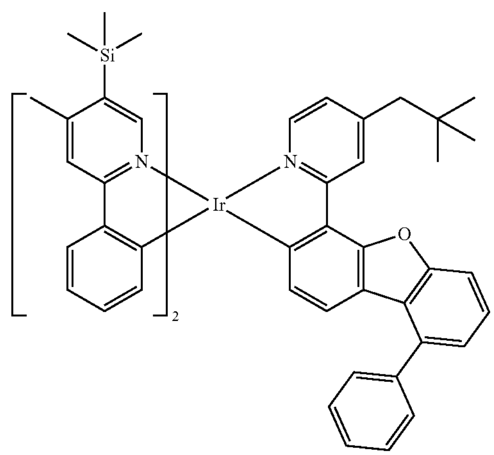
267
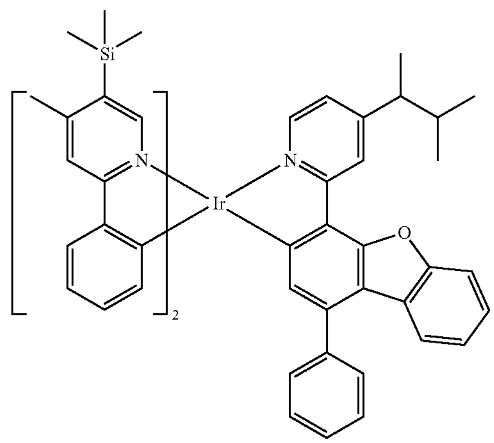

-continued
268
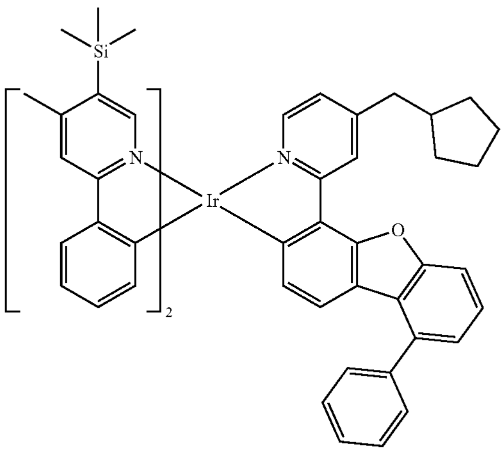
269
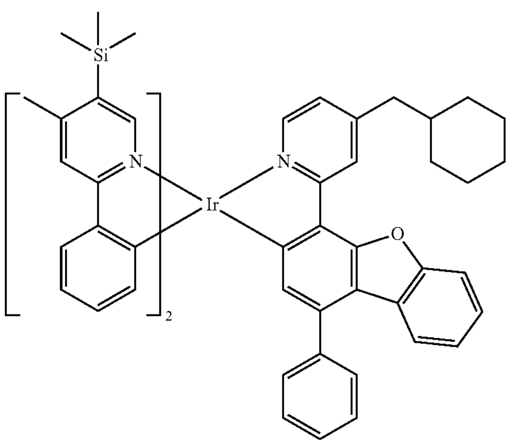
270
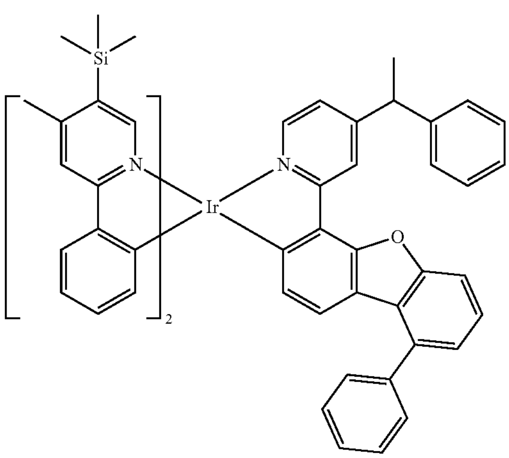
-continued
271
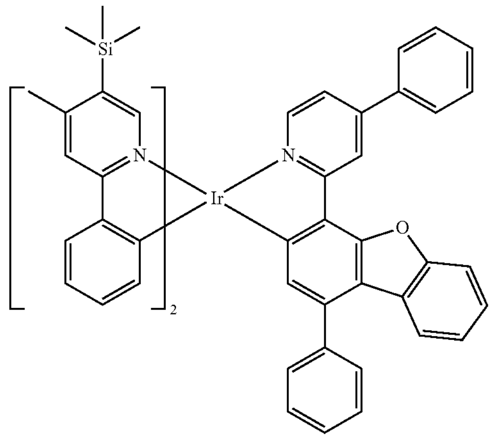
272
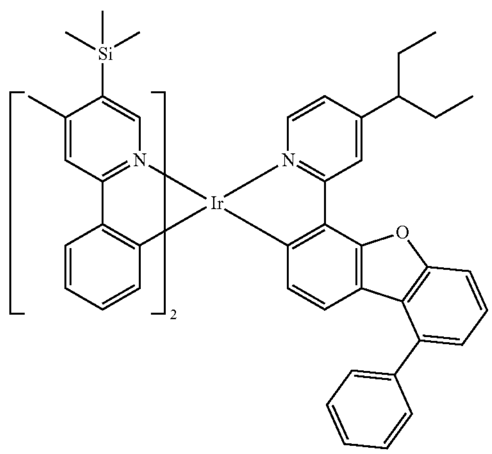
273
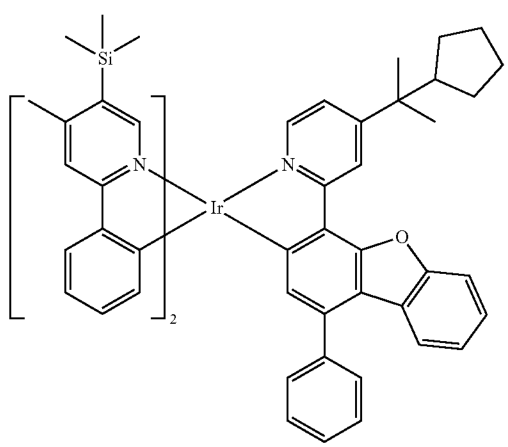

-continued
274
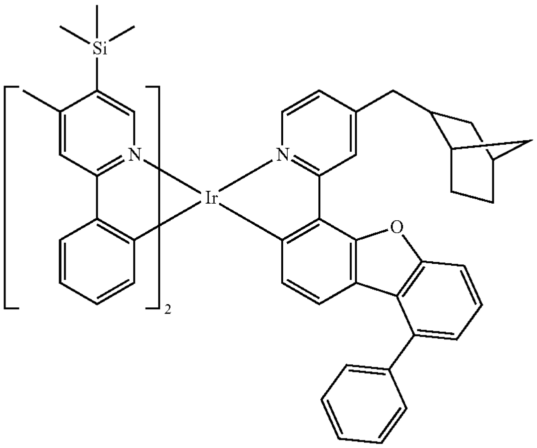
275
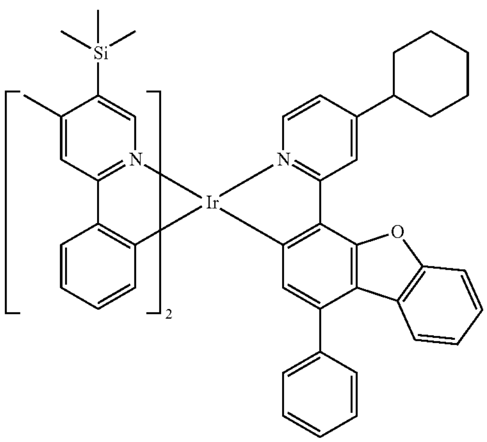
276
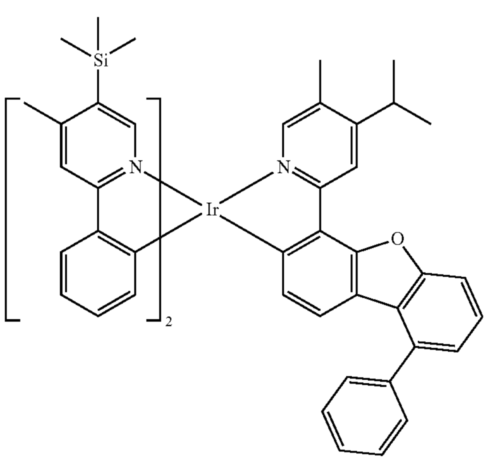
-continued
277
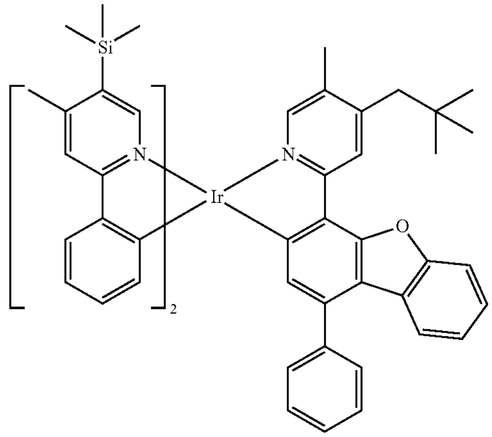
278
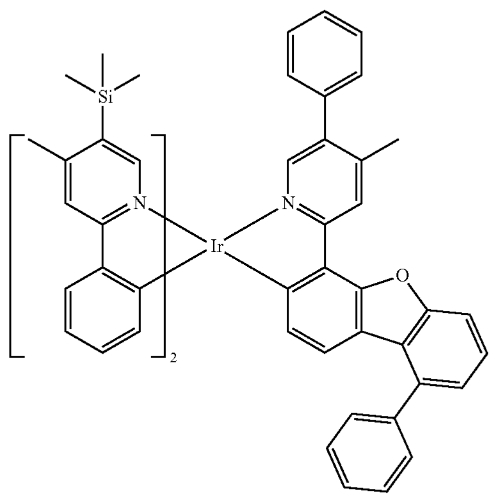
279
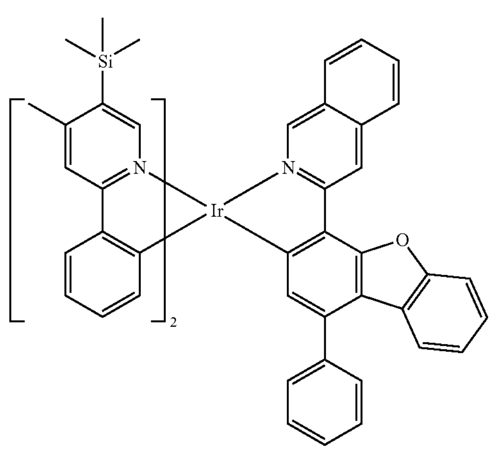

-continued
280
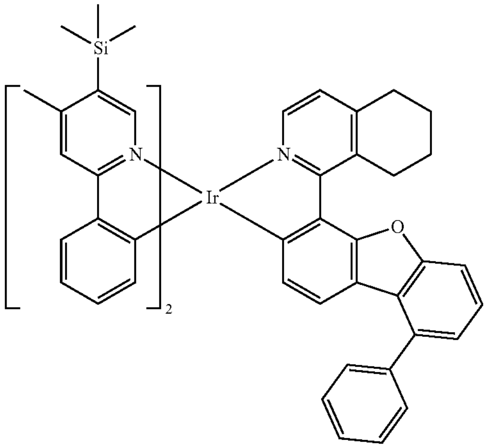
281
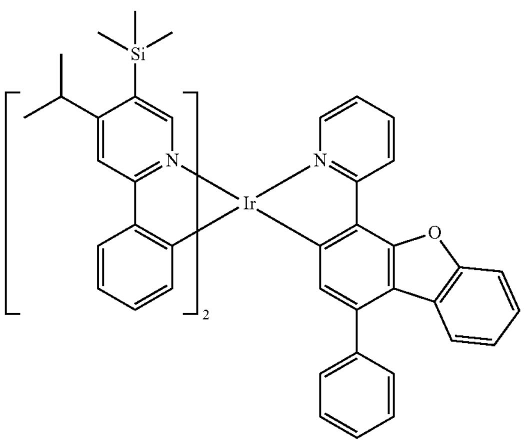
282
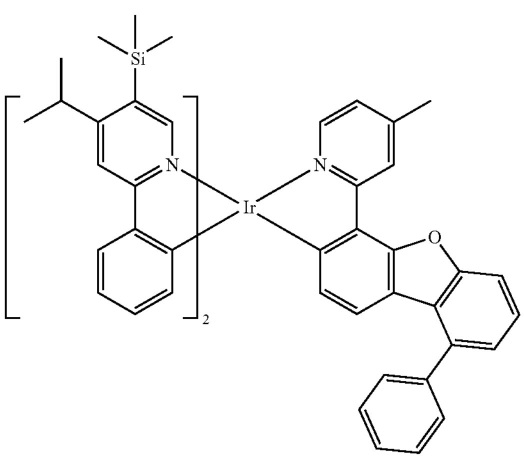
-continued
283
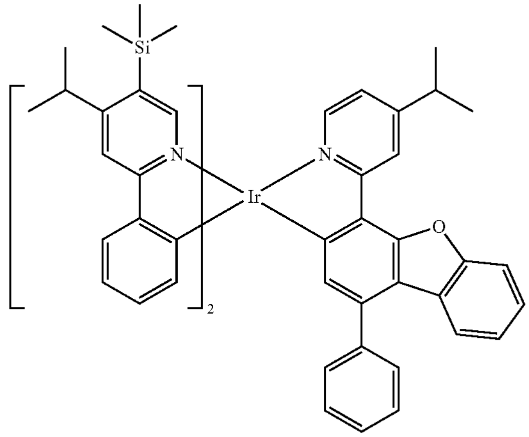
284
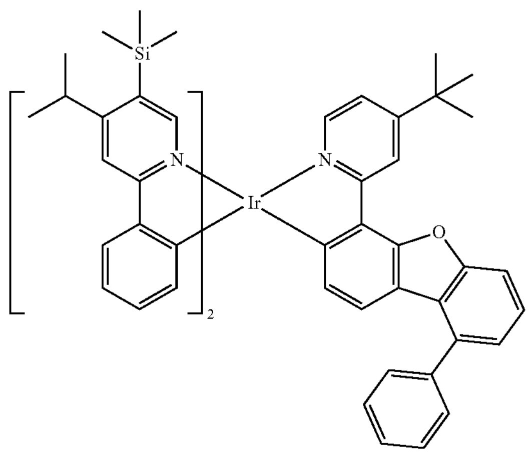
285
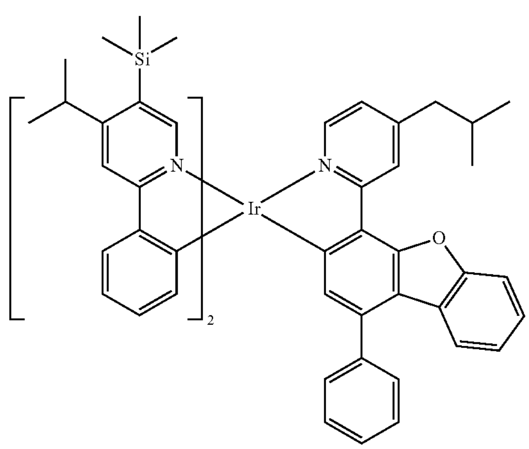

-continued
286
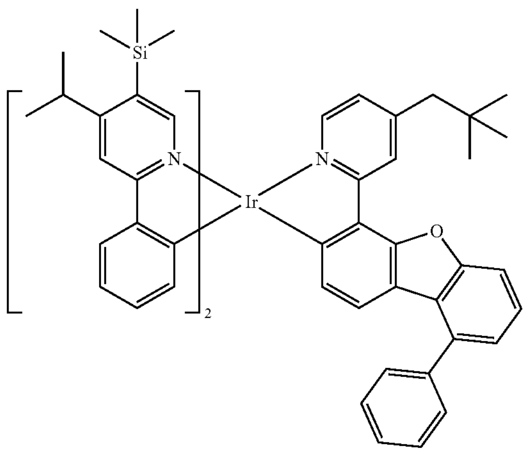
287
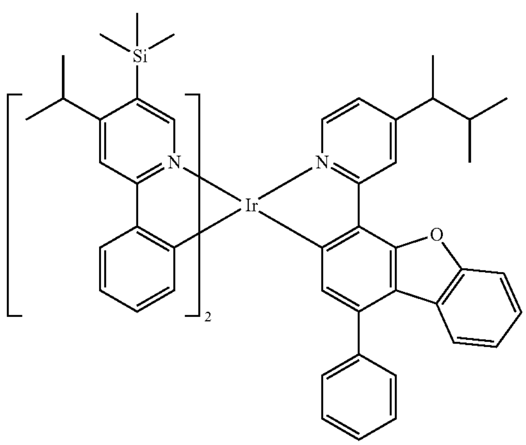
288
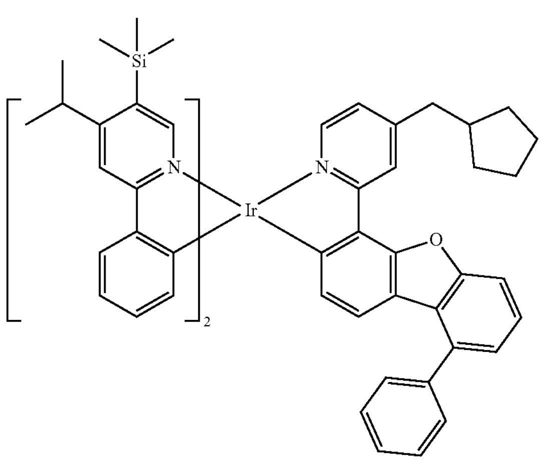
-continued
289
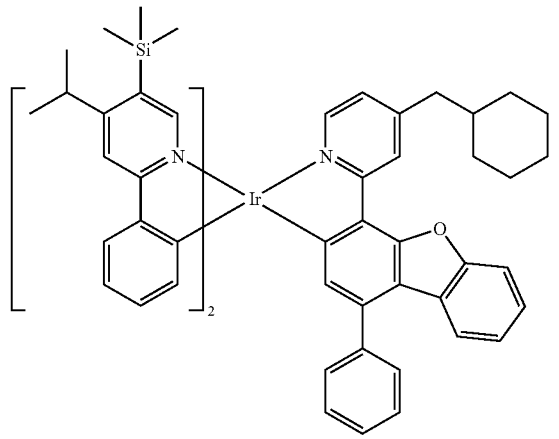
290
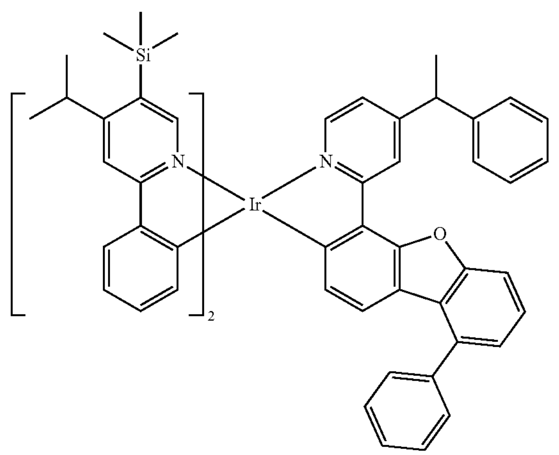
291
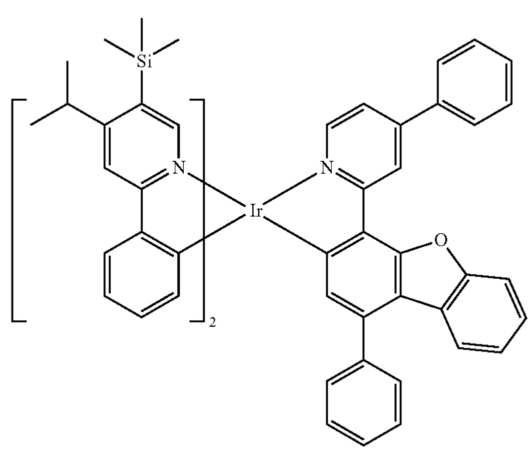

-continued
292
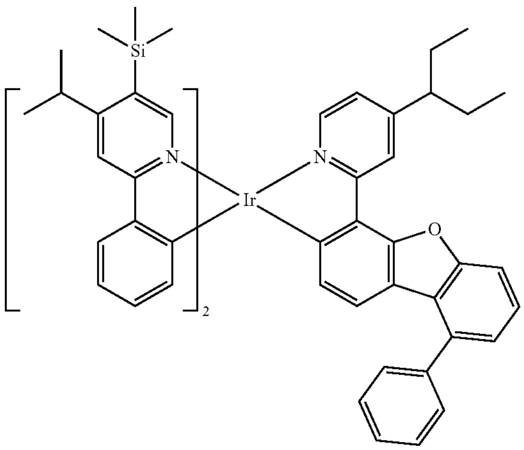
293
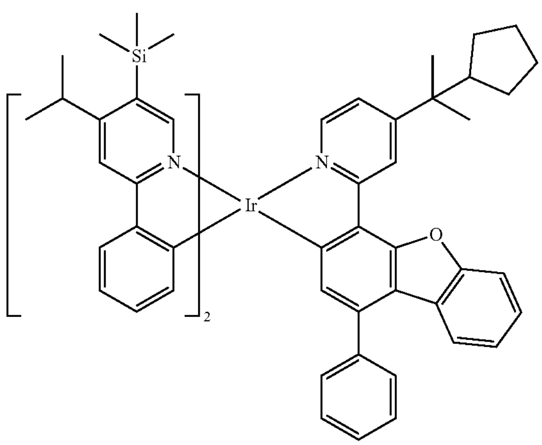
294
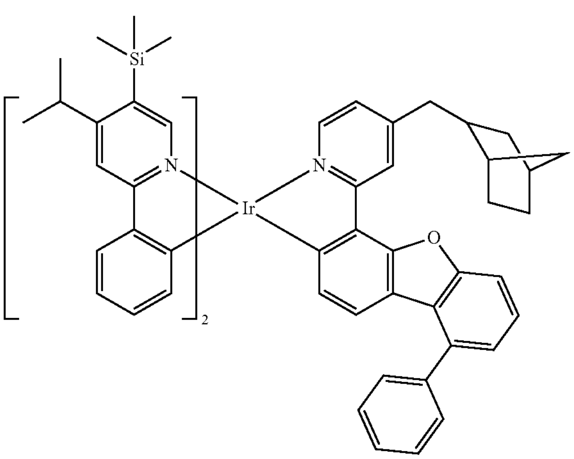
-continued
295
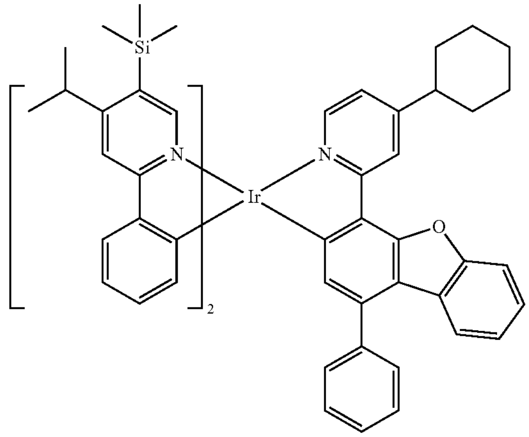
296
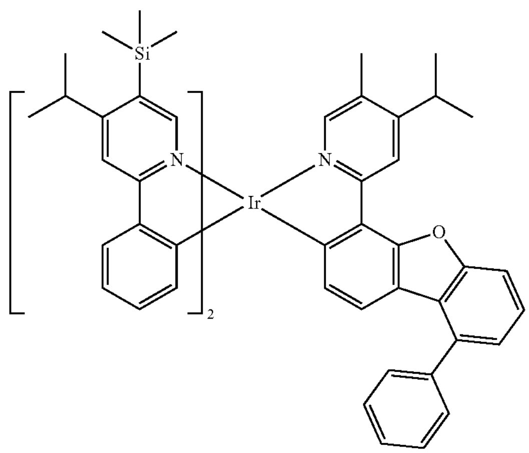
297
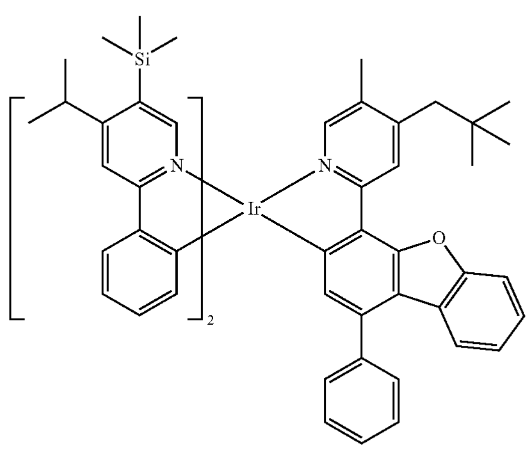

-continued
298
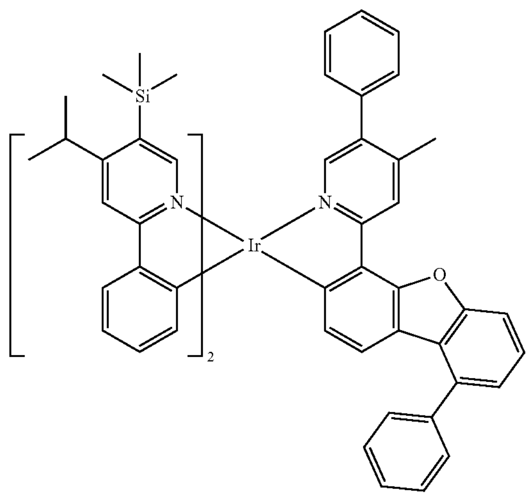
299
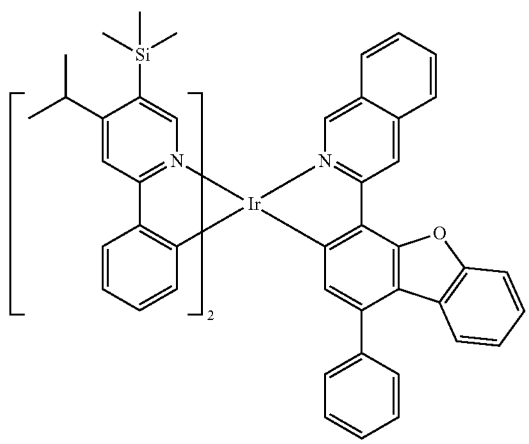
300
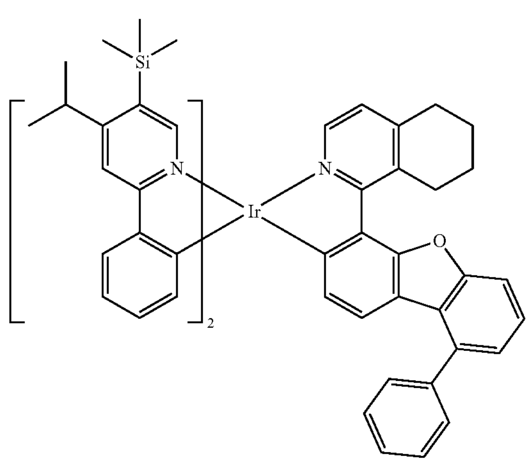
-continued
301
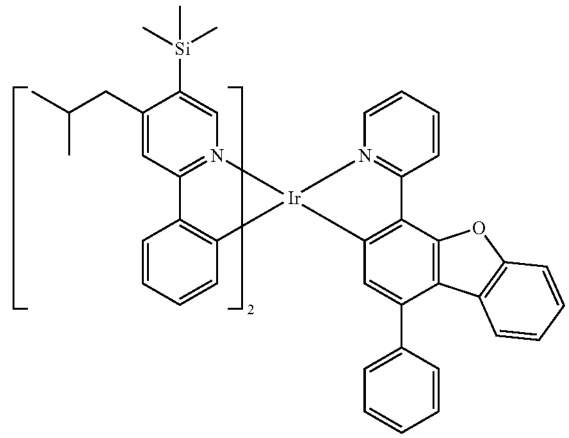
302
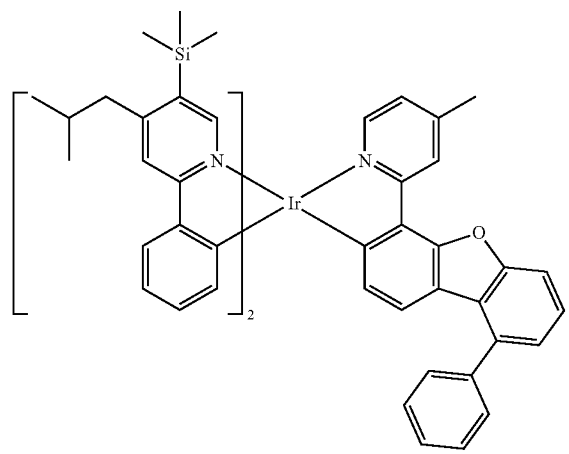
303
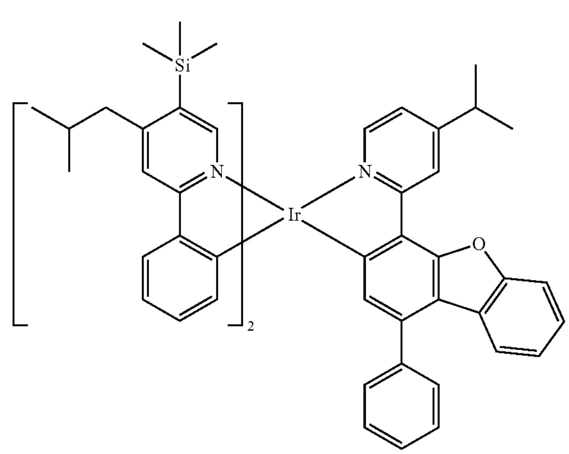

304
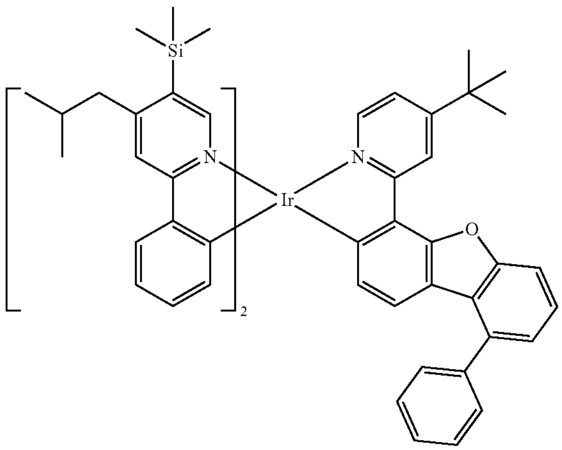
305
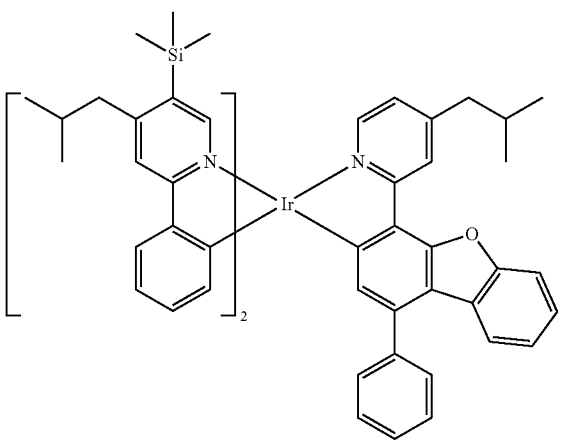
306
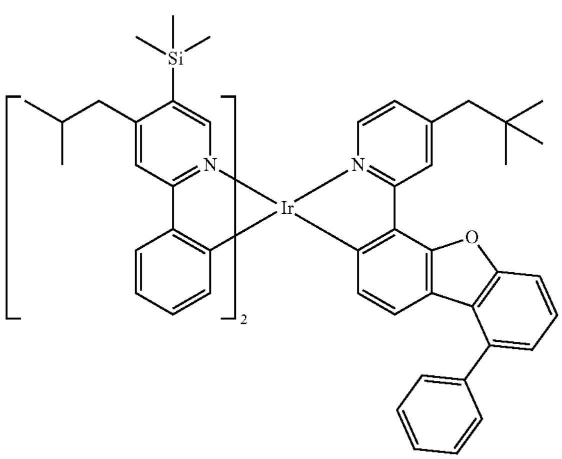
307
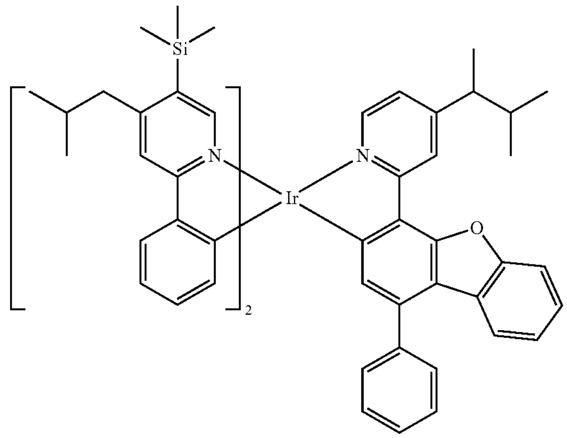
308
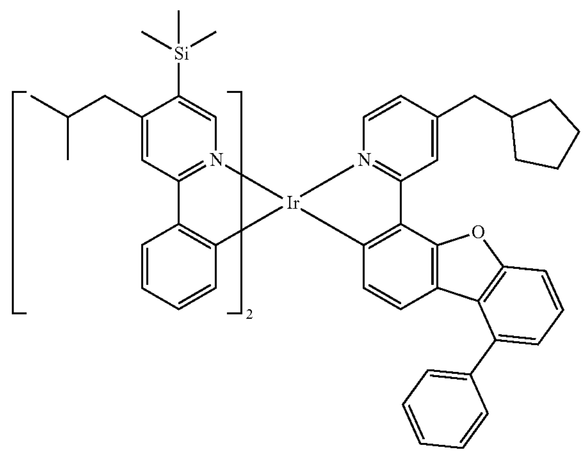
309
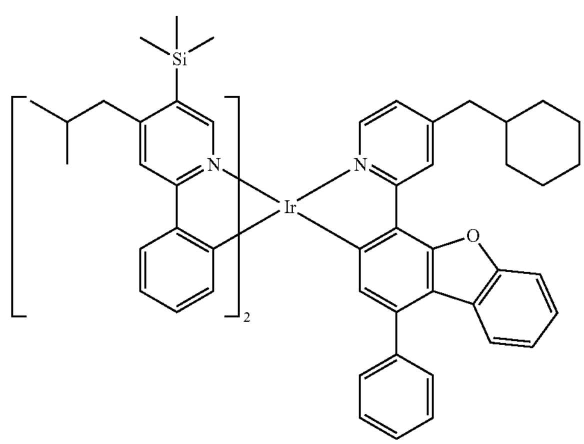

-continued
310
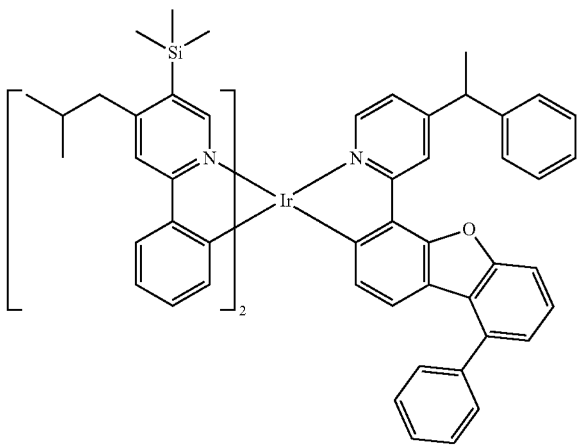
311
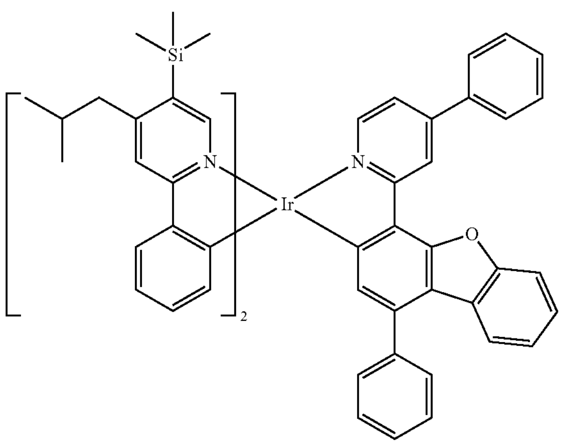
312
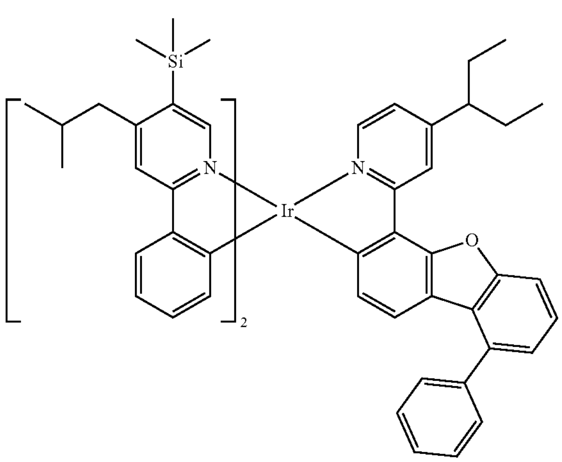
-continued
313
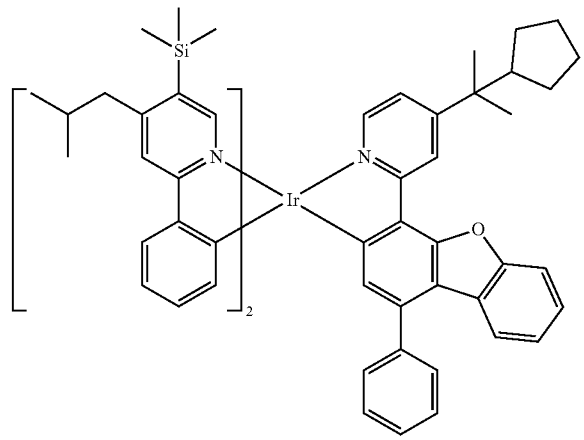
314
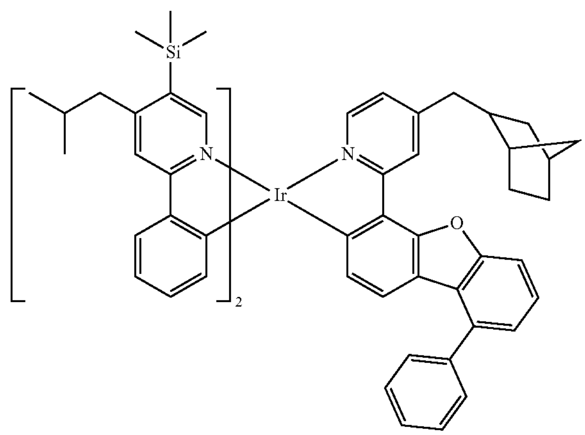
315
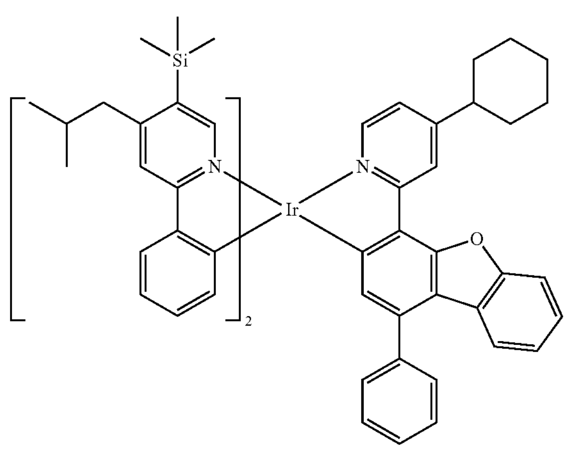

-continued
316
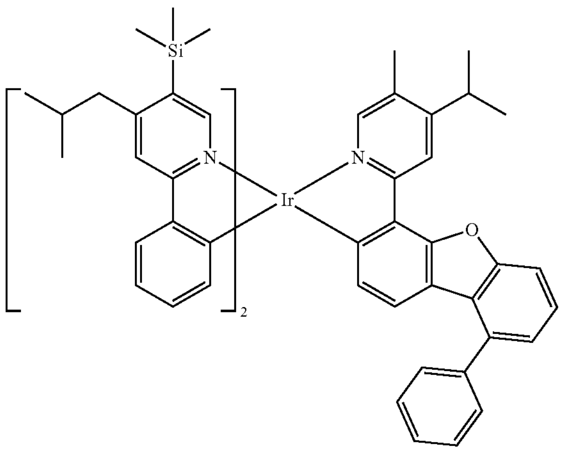
317
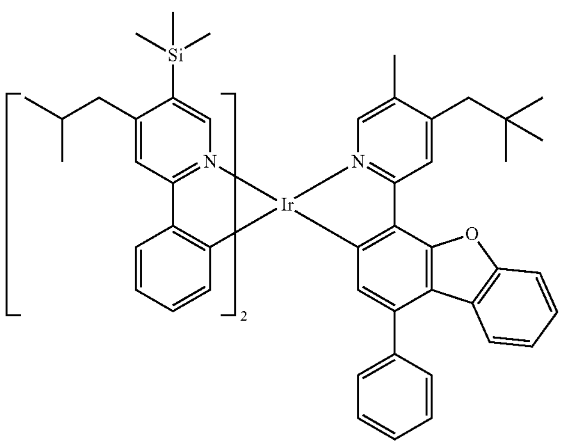
318
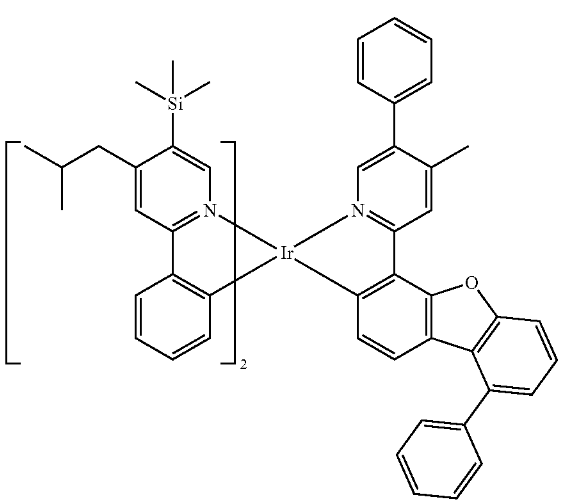
-continued
319
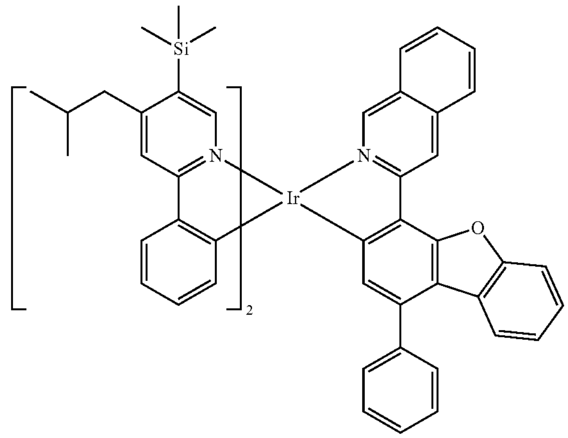
320
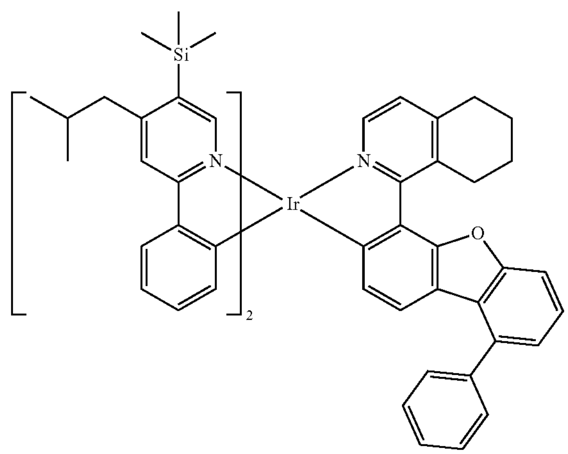
321
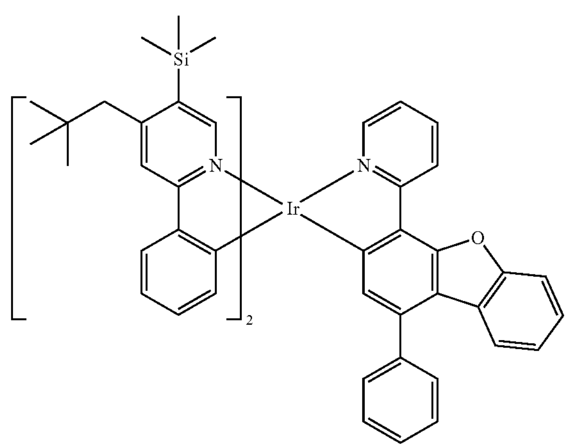

-continued
322
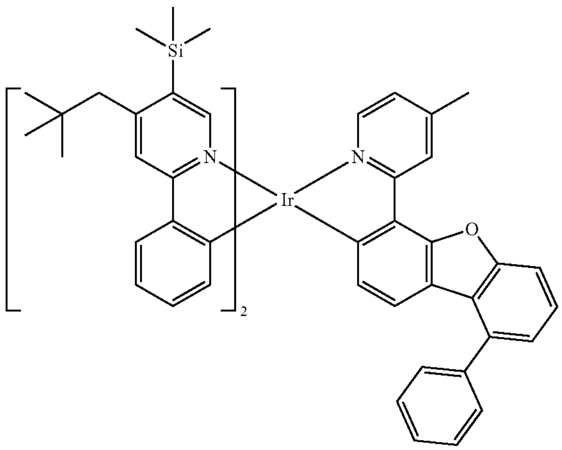
323
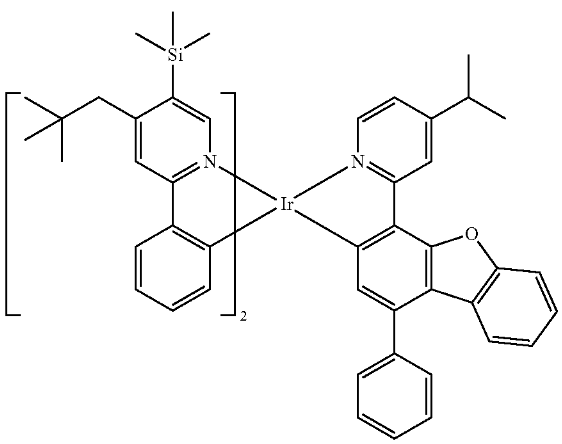
324
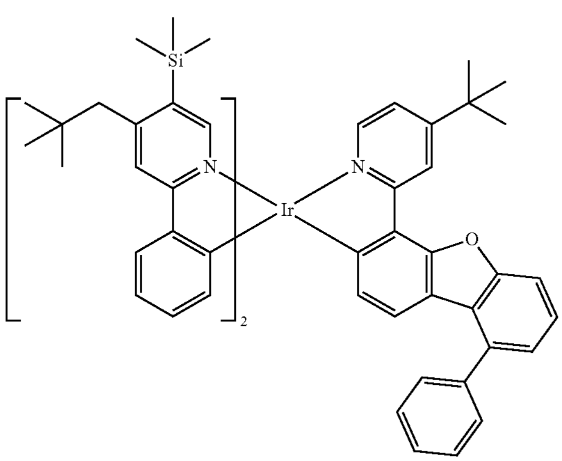
-continued
325
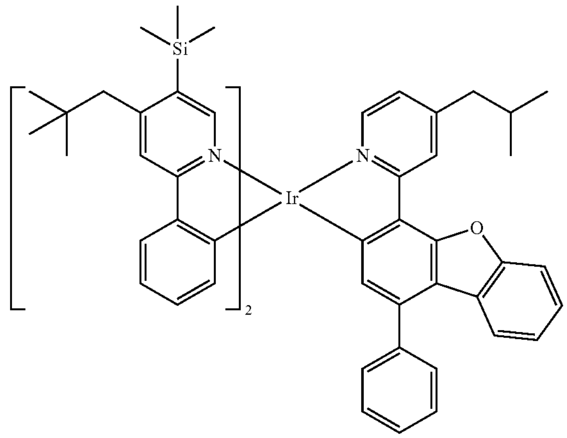
326
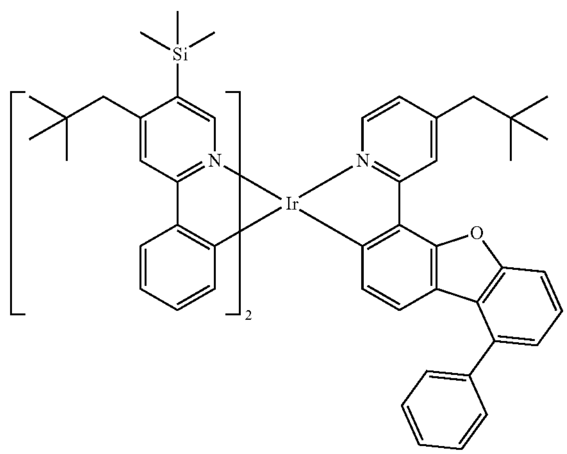
327
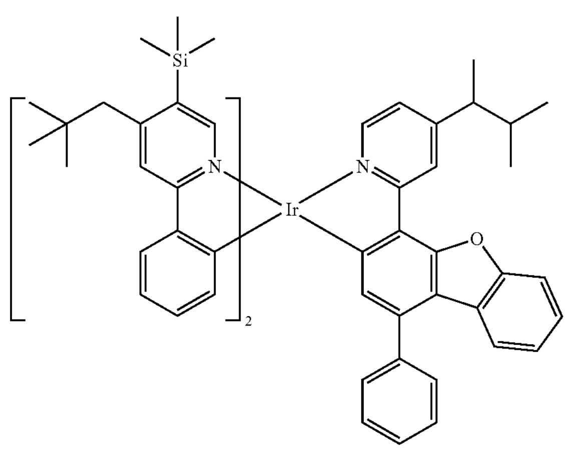

-continued
328
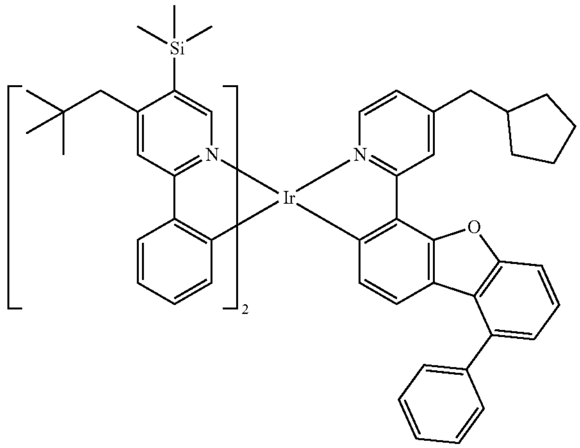
329
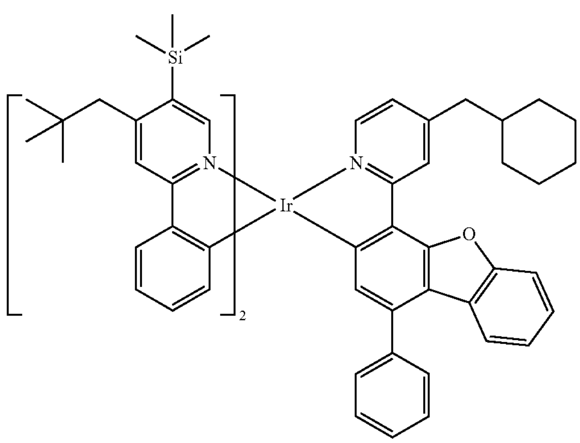
330
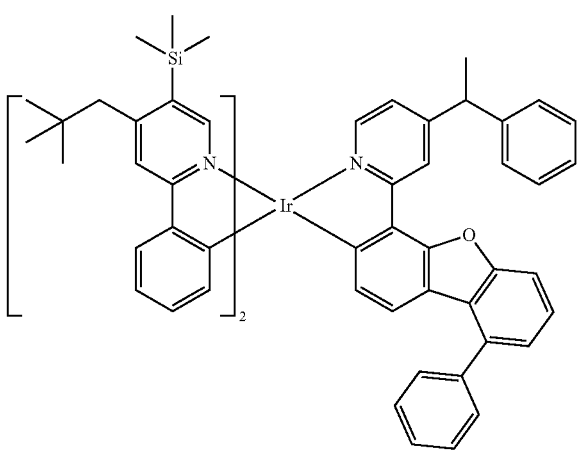
-continued
331
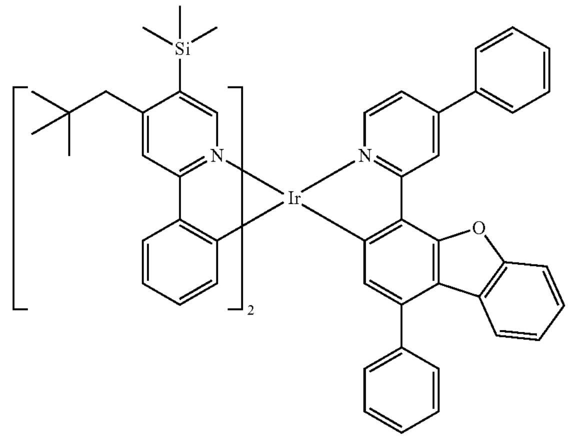
332
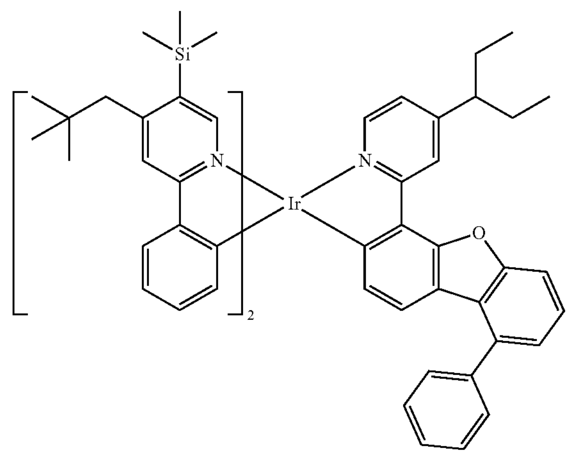
333
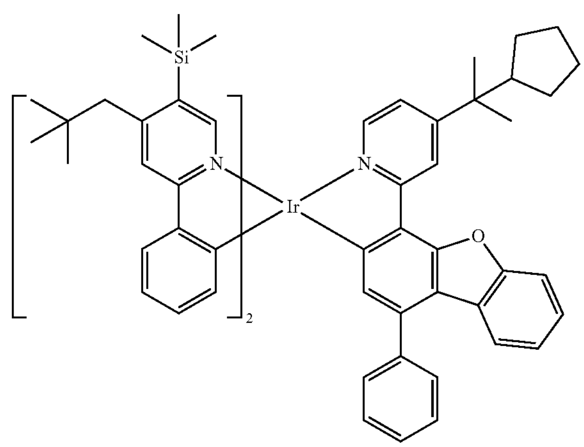

-continued
332
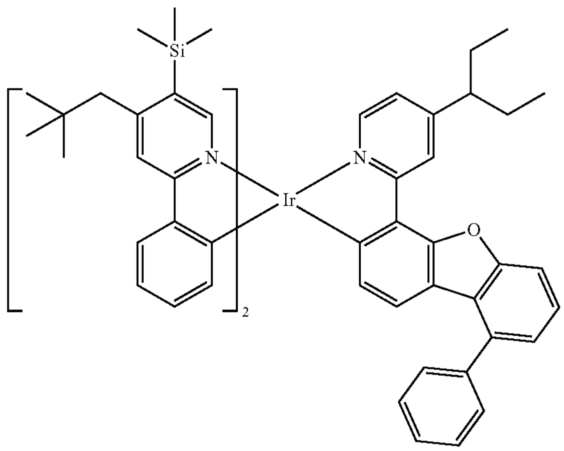
334
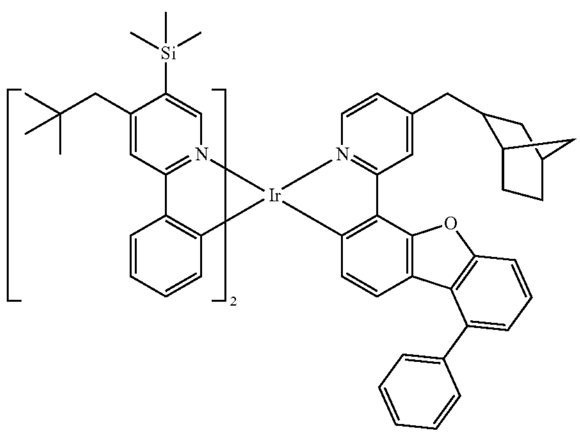
335
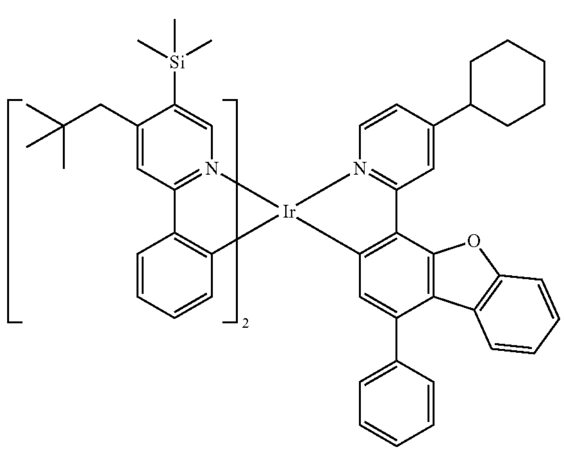
-continued
336
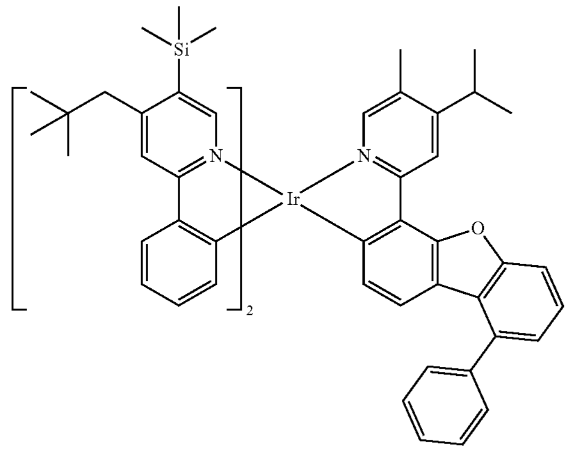
337
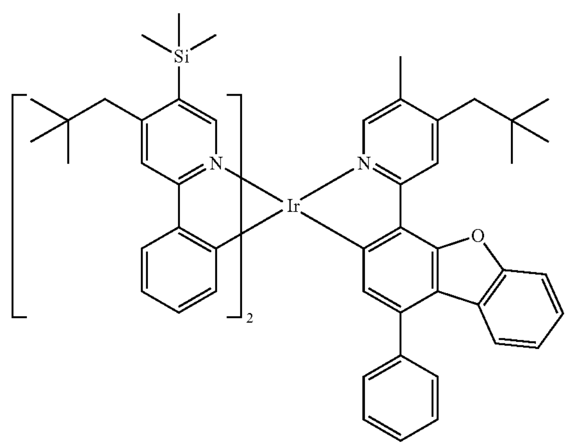
338
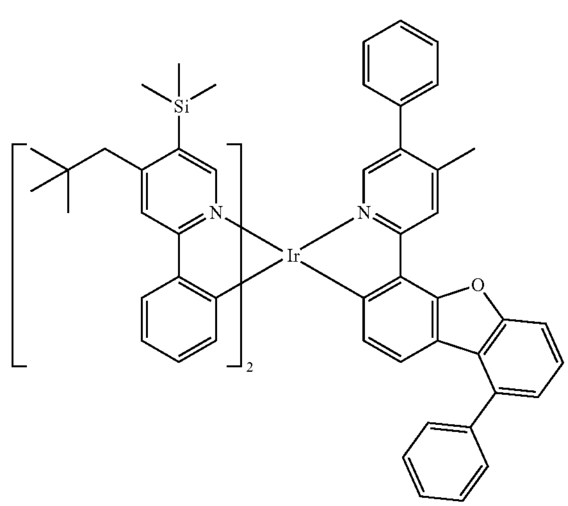

-continued
339
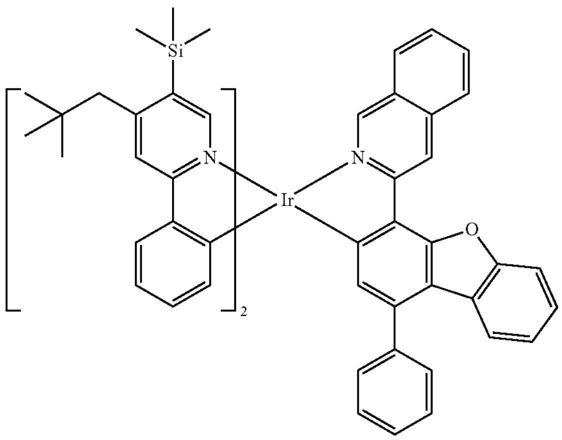
340
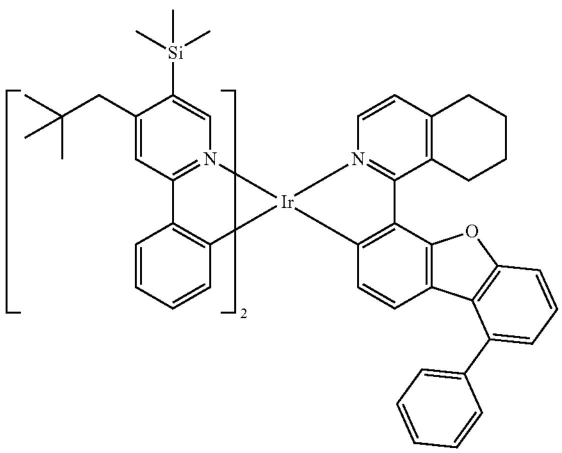
341
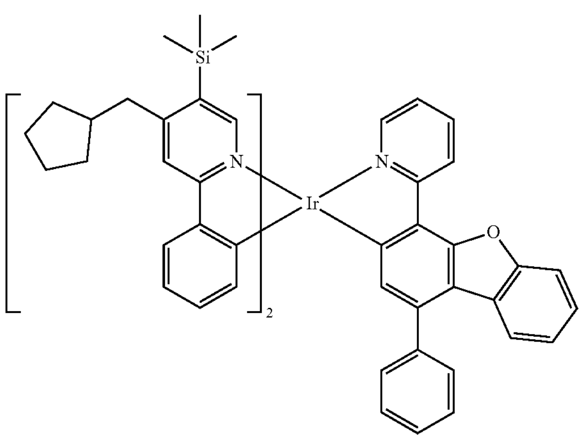
-continued
342
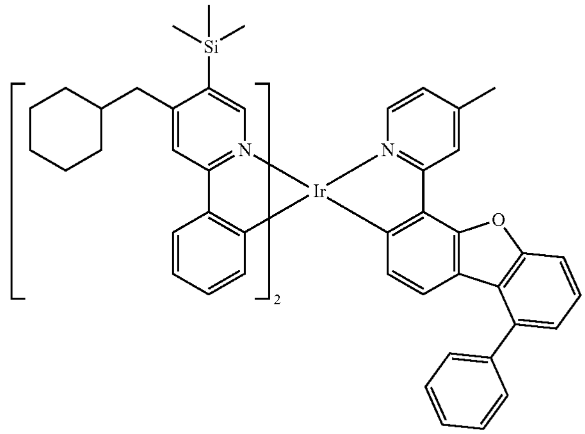
343
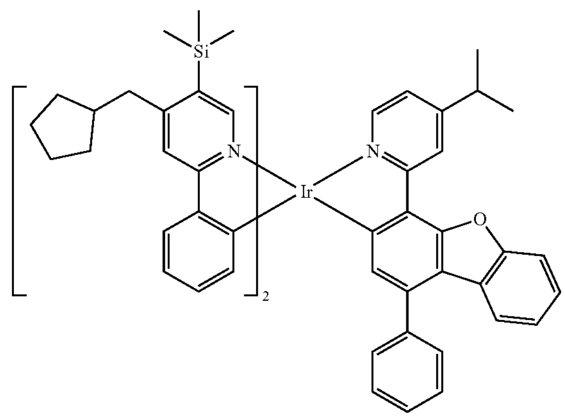
344
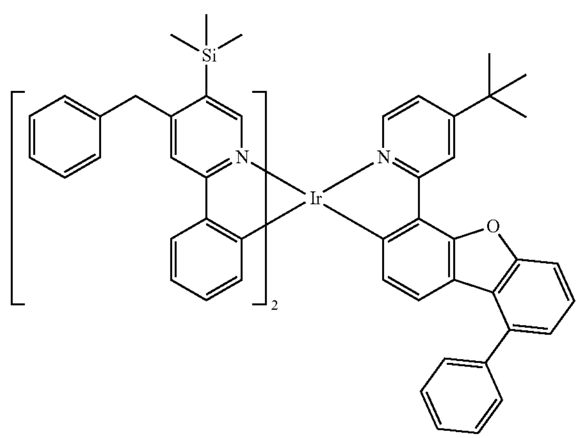

345
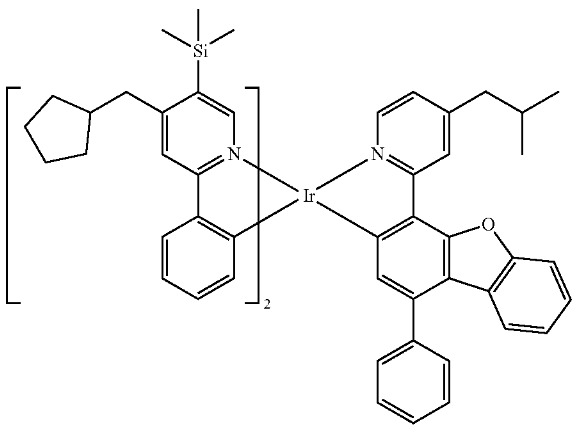
346
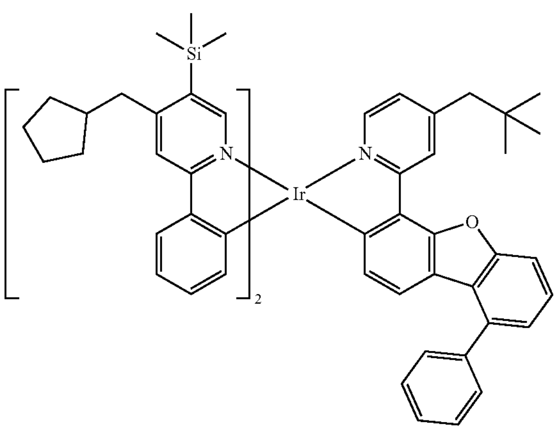
347
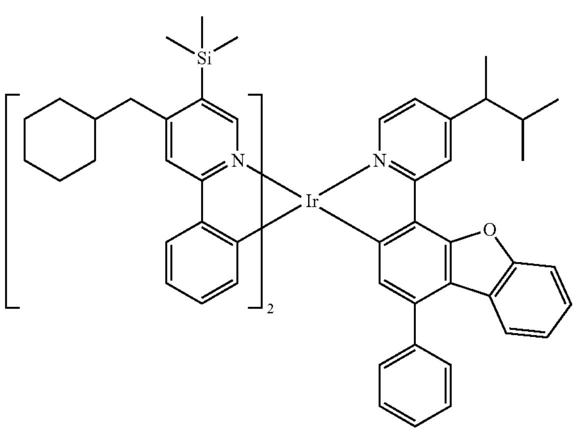
348
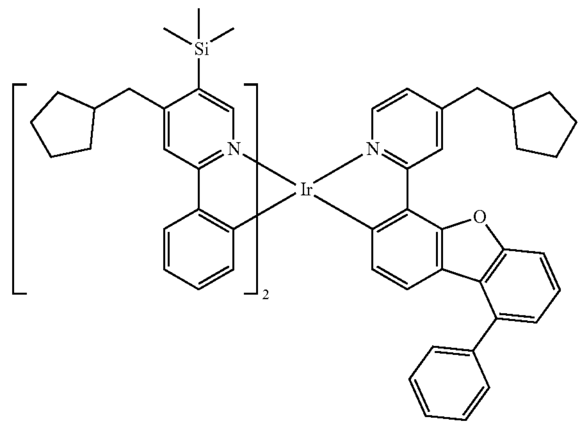
349
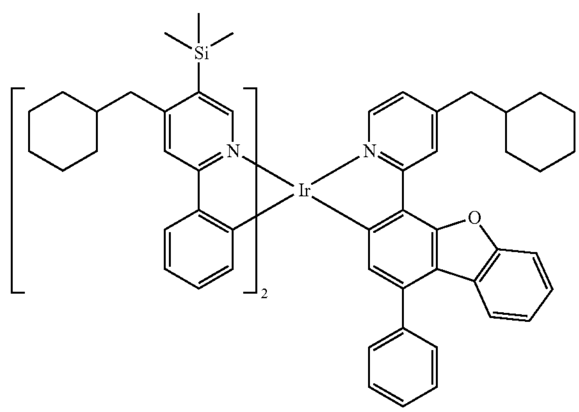
350
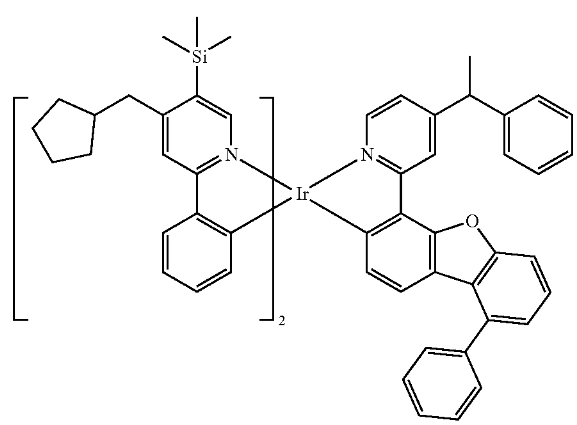

351
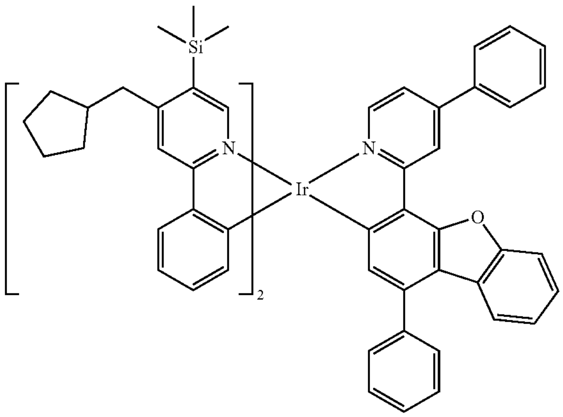
352
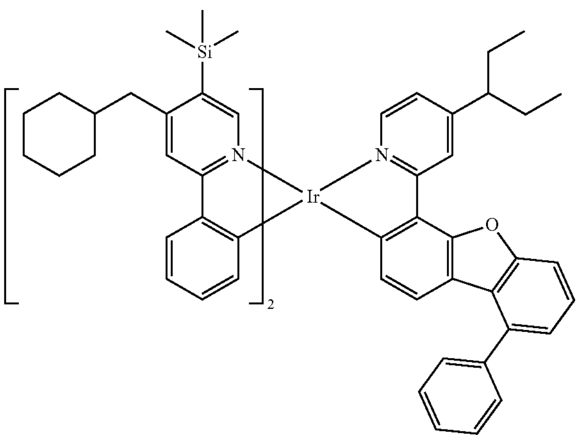
353
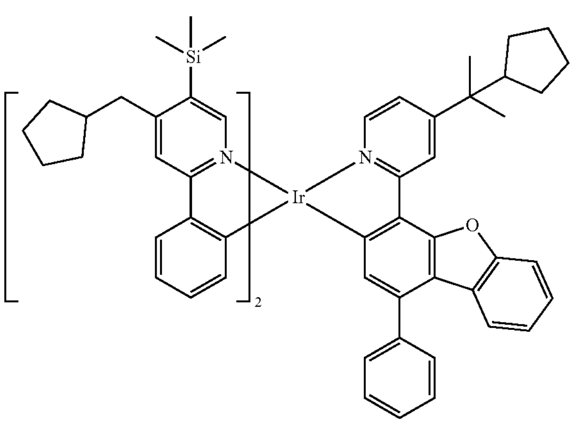
354
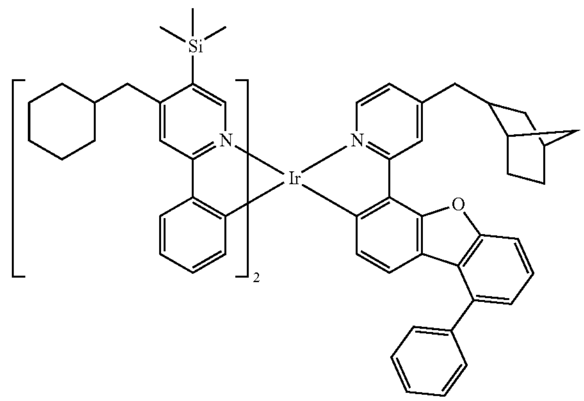
355
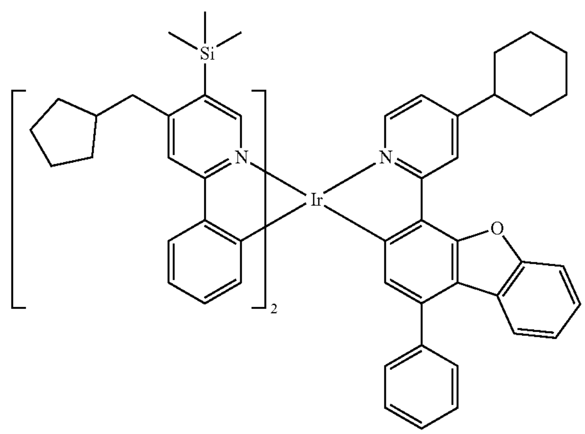
356
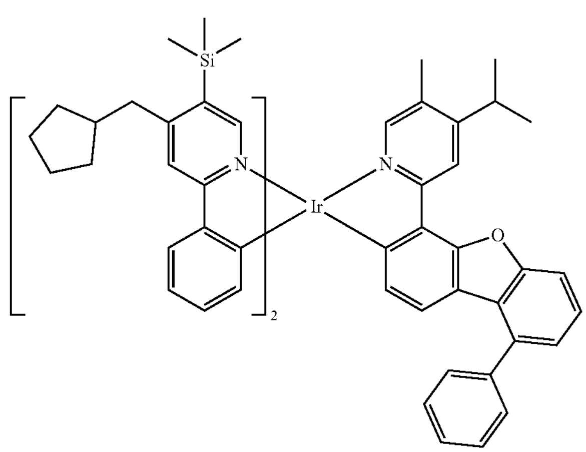

-continued
357
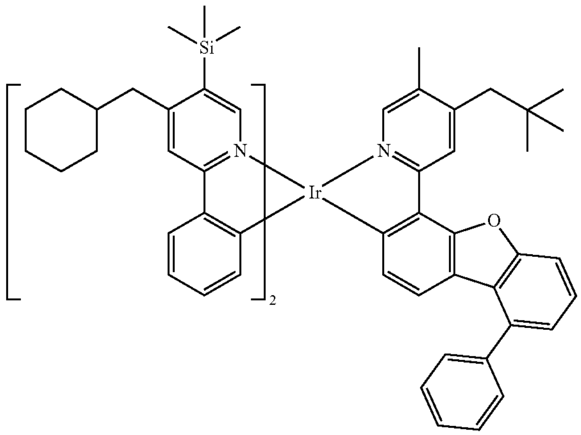
358
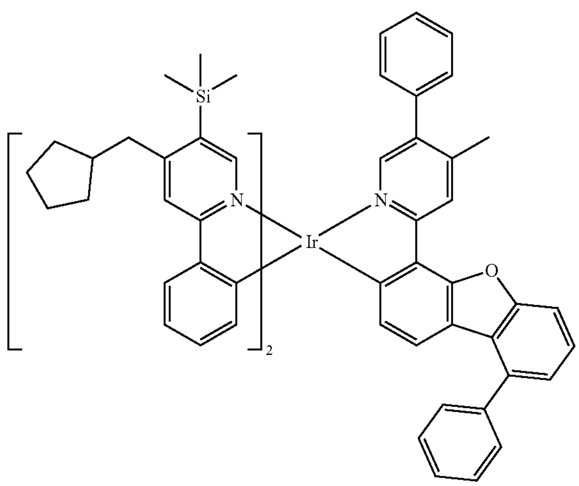
359
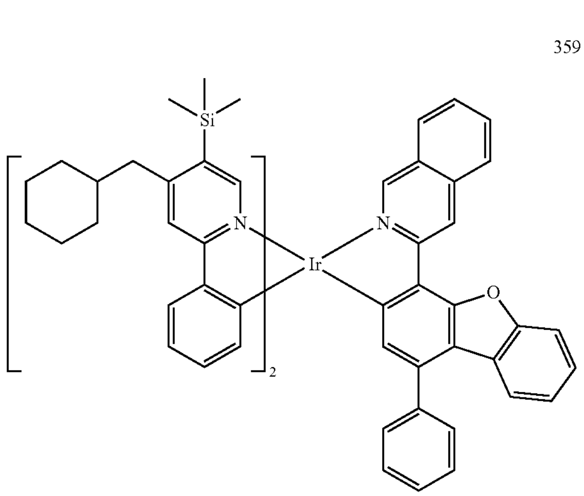
-continued
360
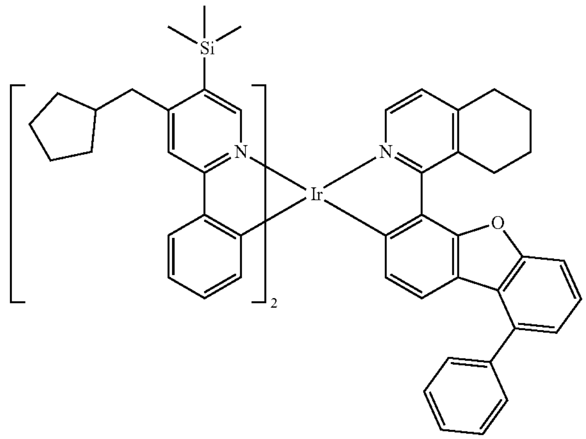
361
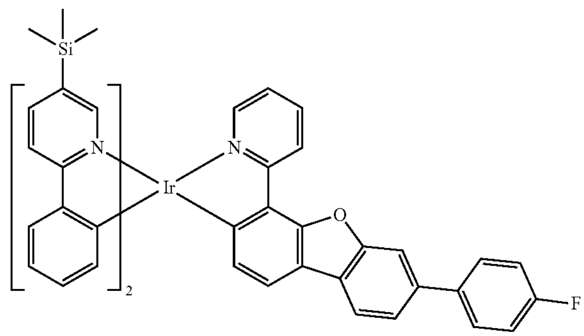
362
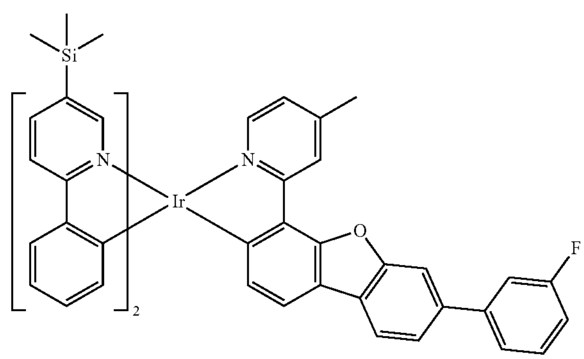
363
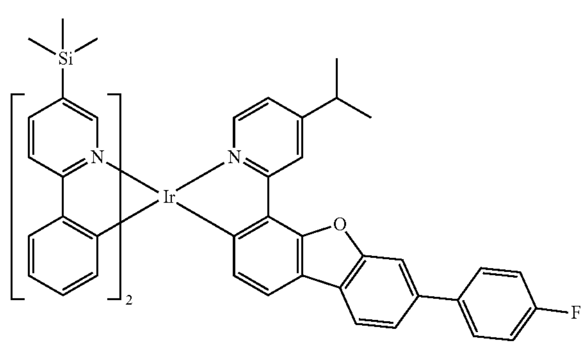

364
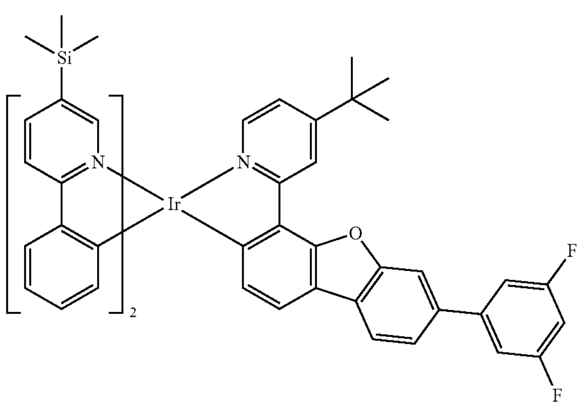
365
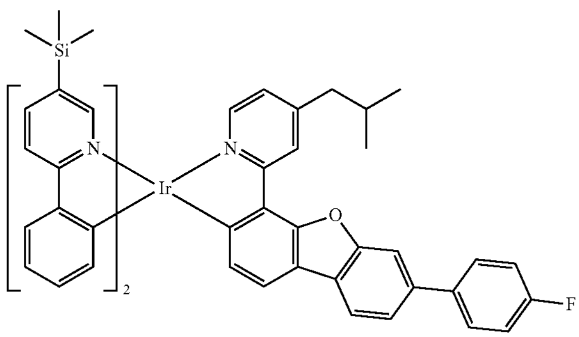
366
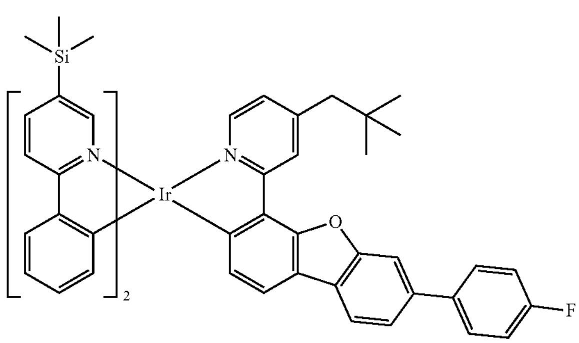
367
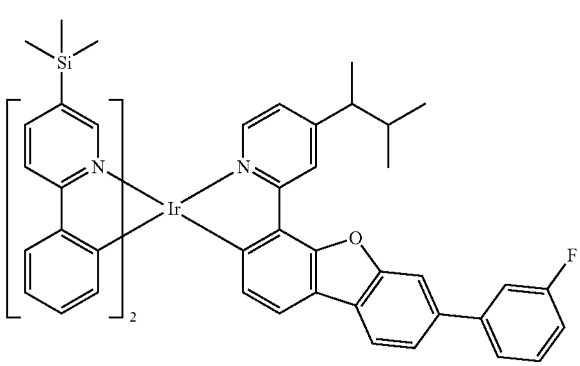
368
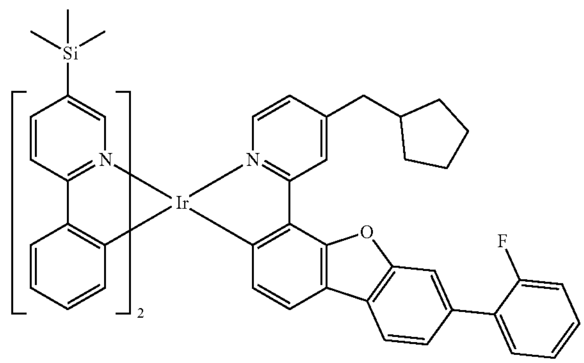
369
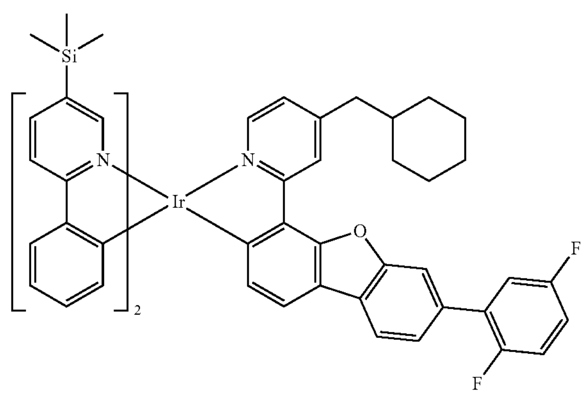
370
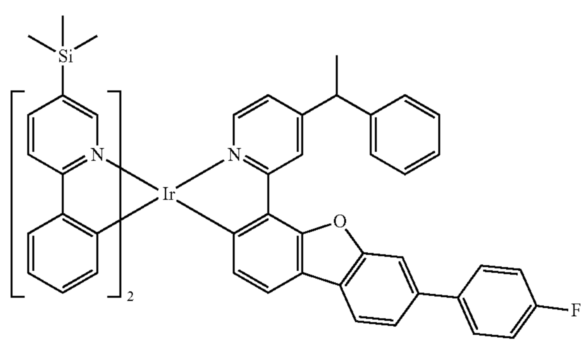
371
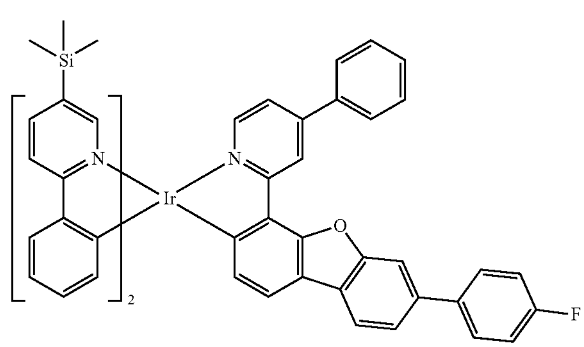

372
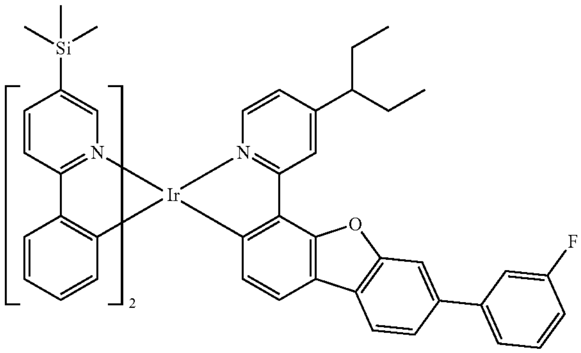
373
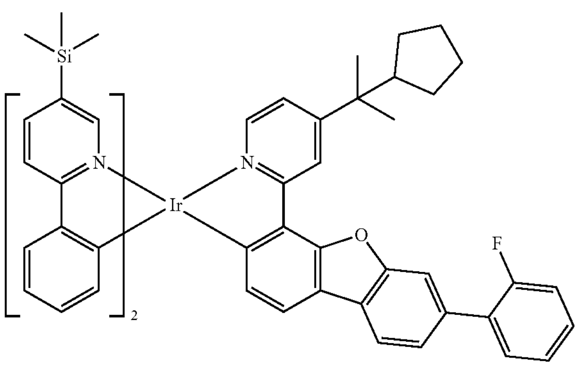
374
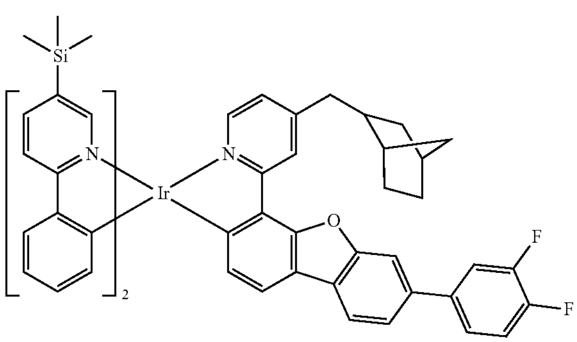
375
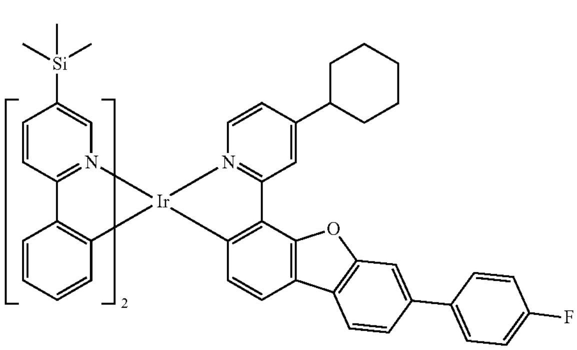
376
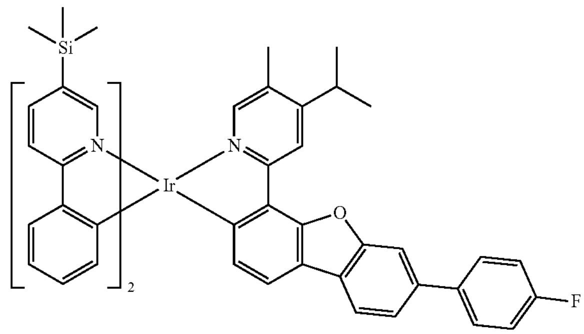
377
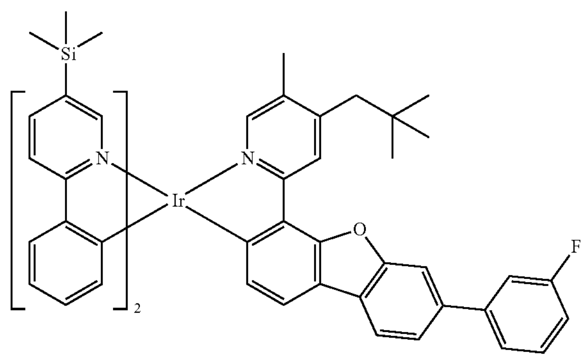
378
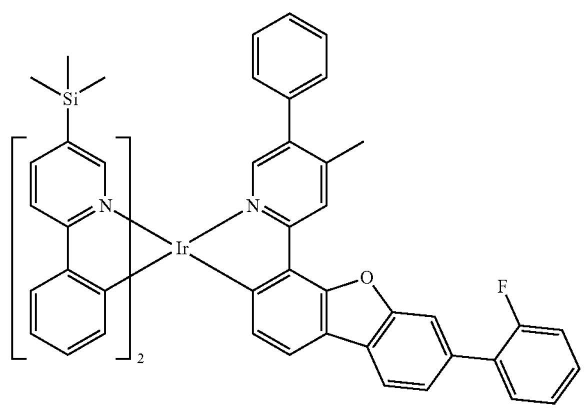
379
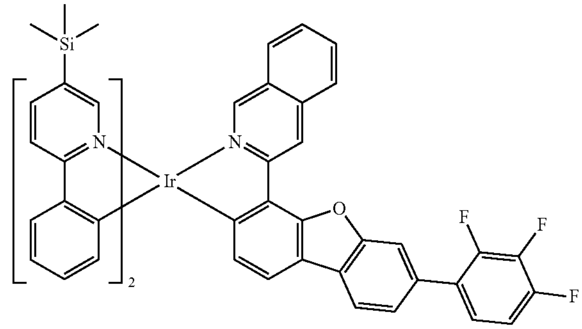

-continued
380
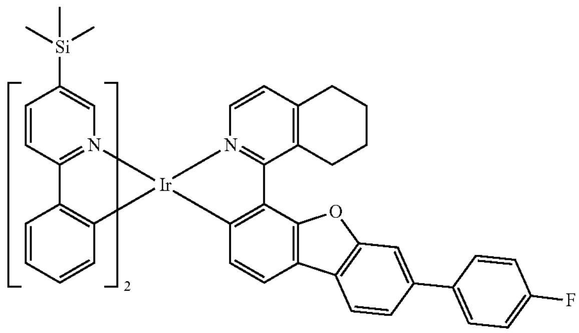
381
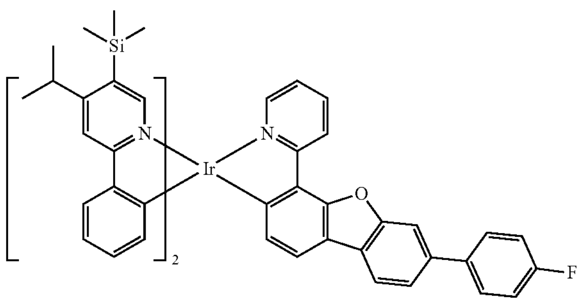
382
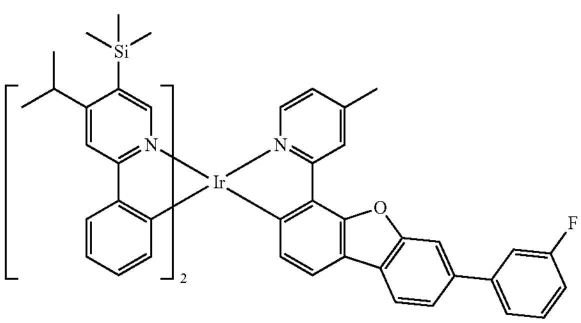
383
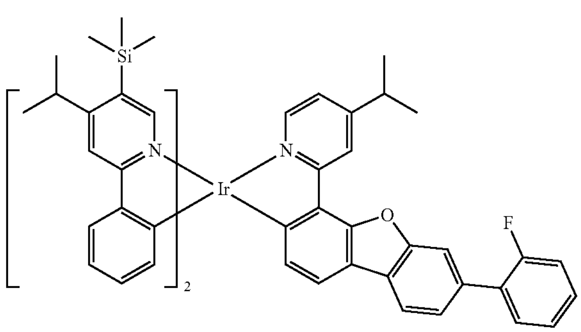
-continued
384
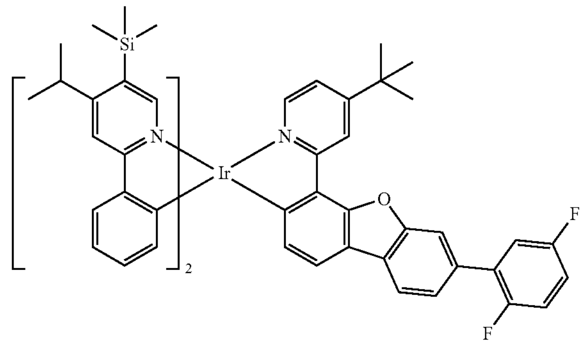
385
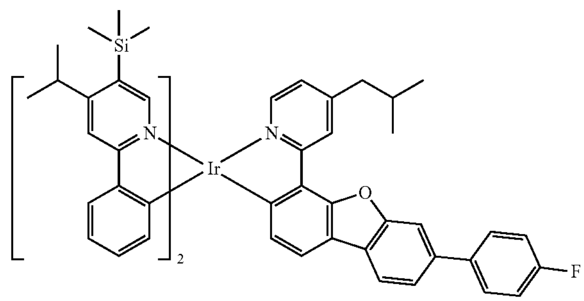
386
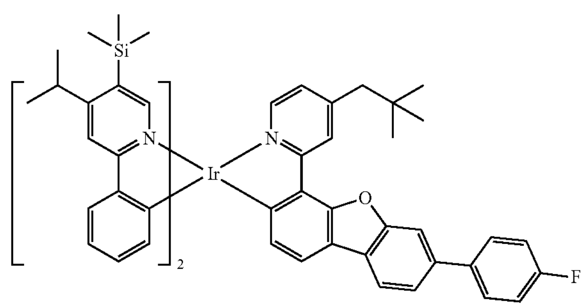
387
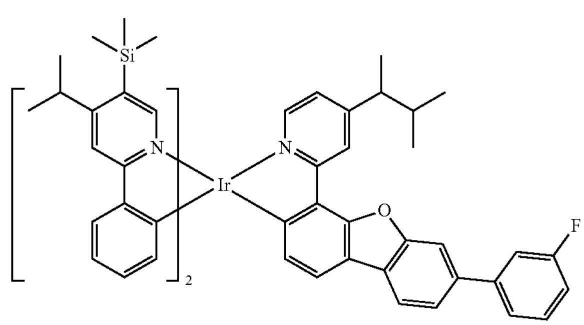

-continued
388
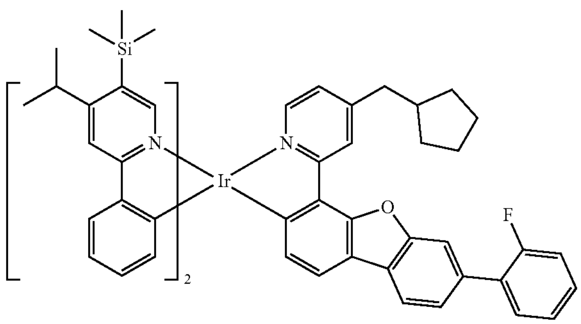
389
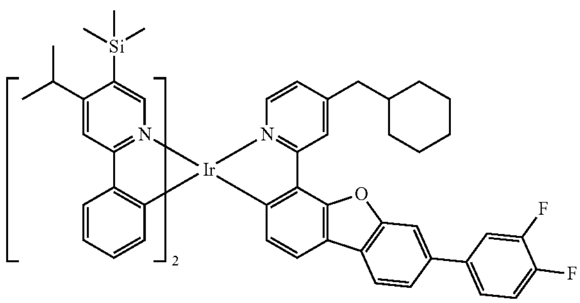
390
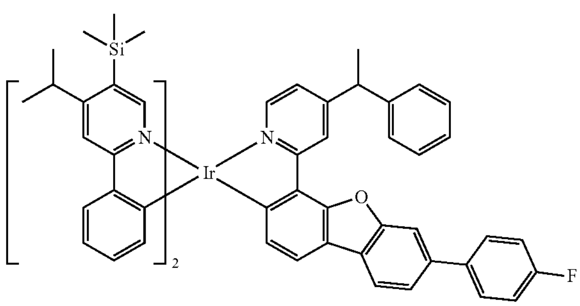
391
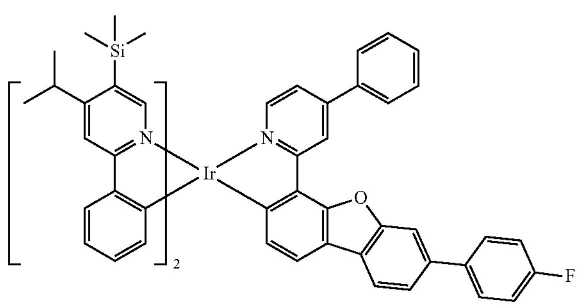
392
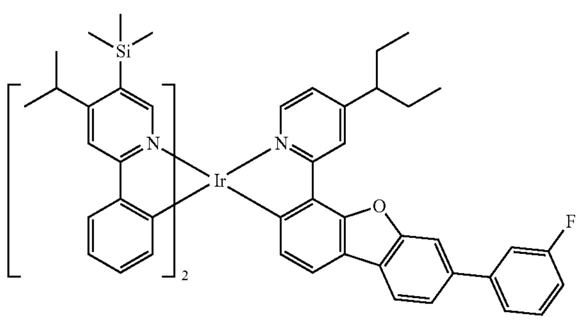
-continued
393
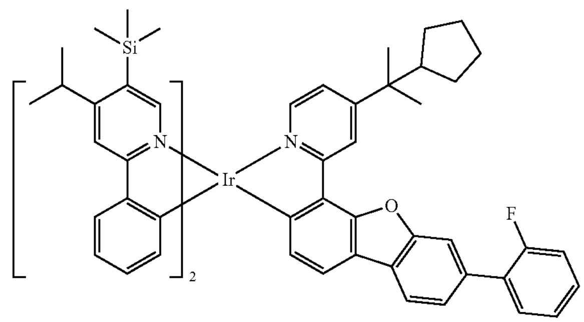
394
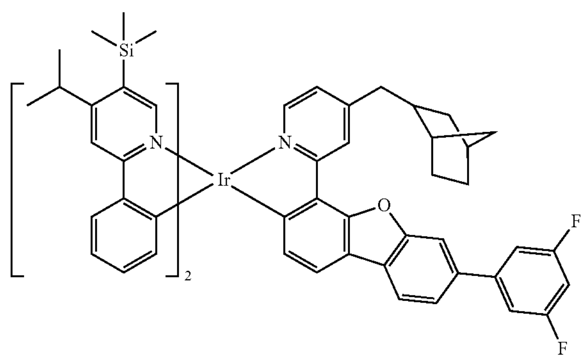
395
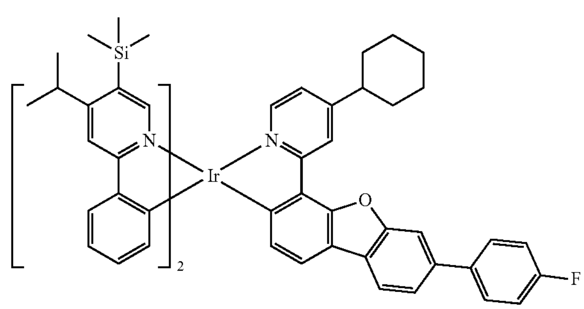
396
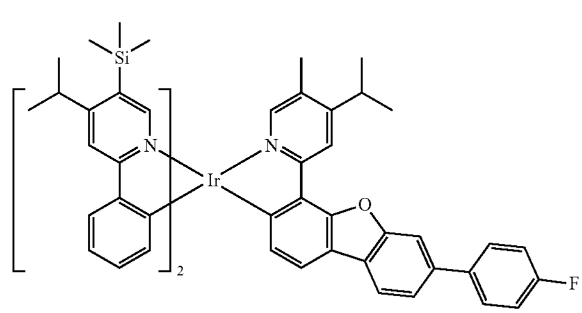

-continued
397
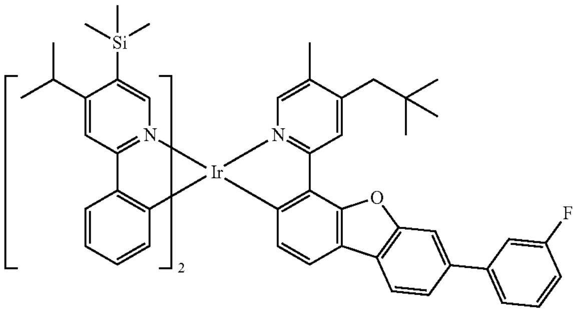
398
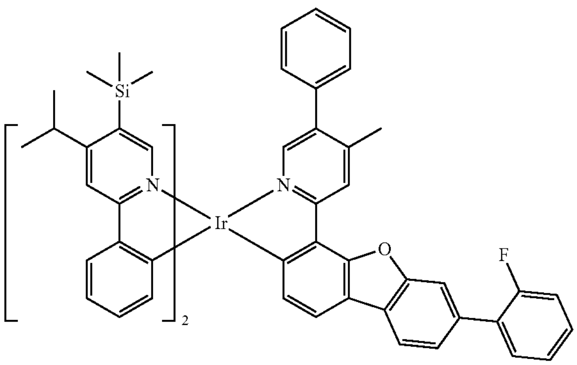
399
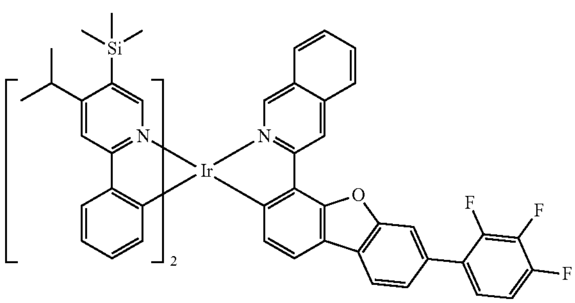
400
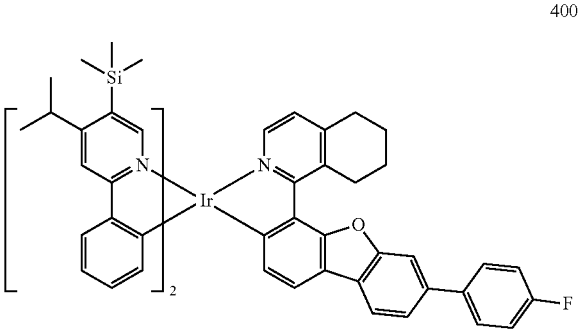
401
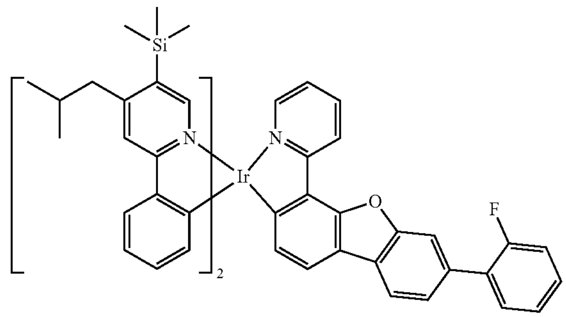
402
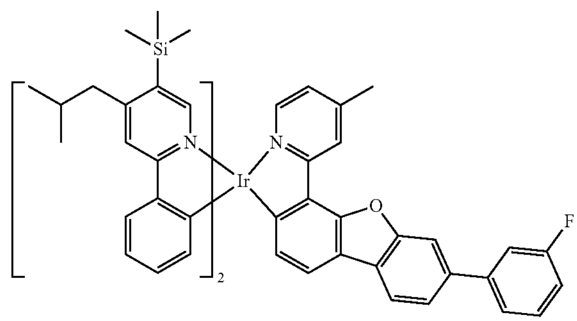
403
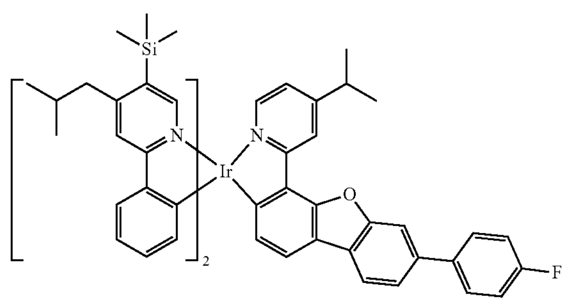
404
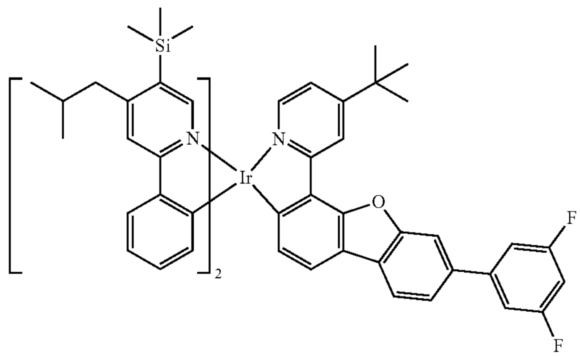

-continued
405
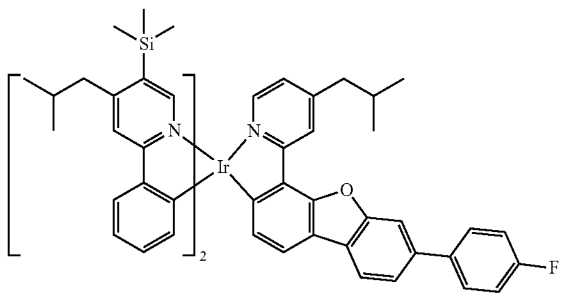
406
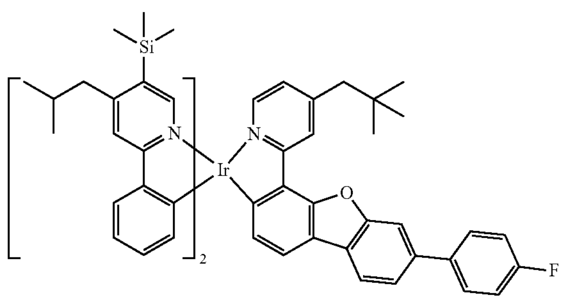
407
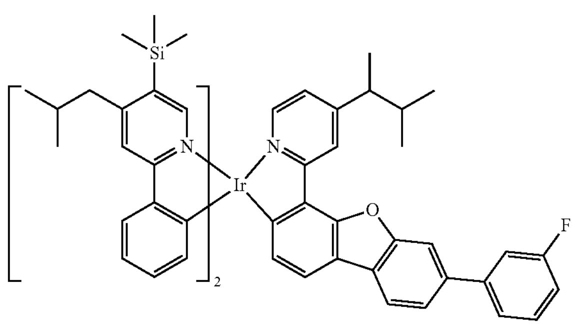
408
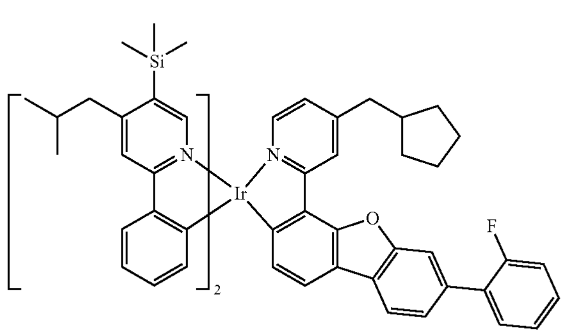
-continued
409
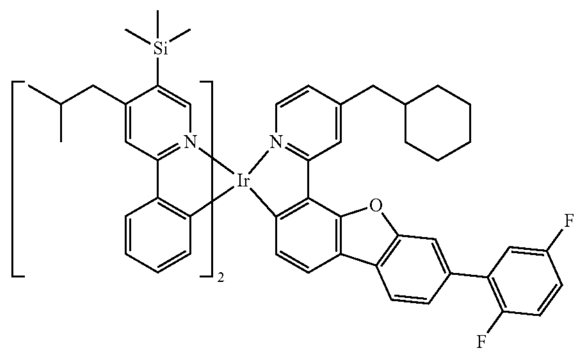
410
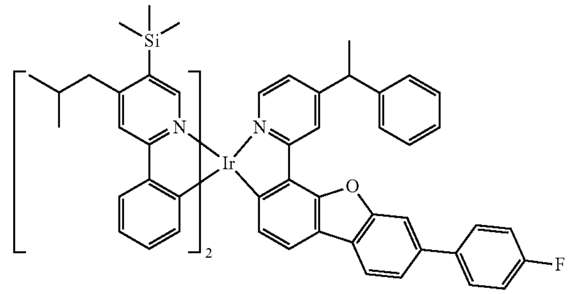
411
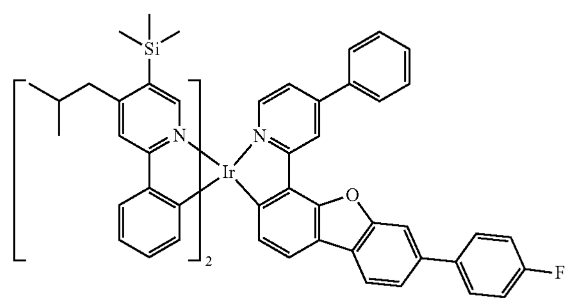
412
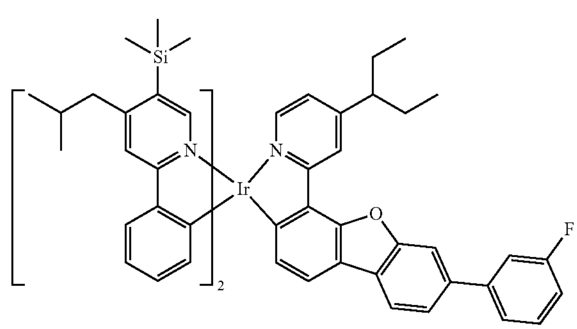

-continued
413
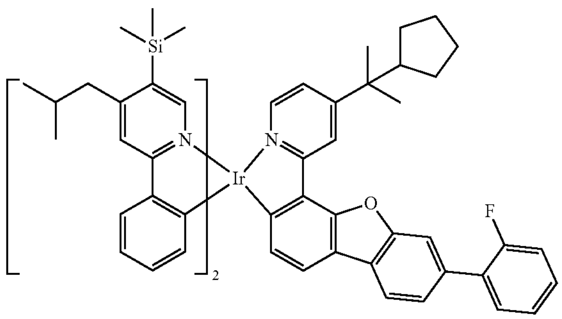
414
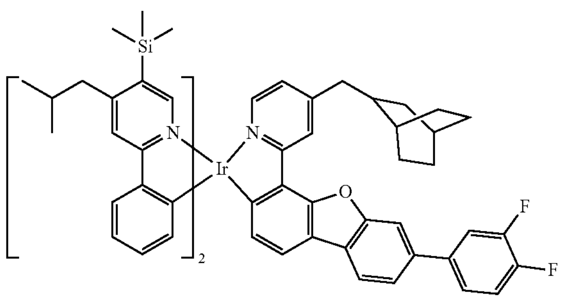
415
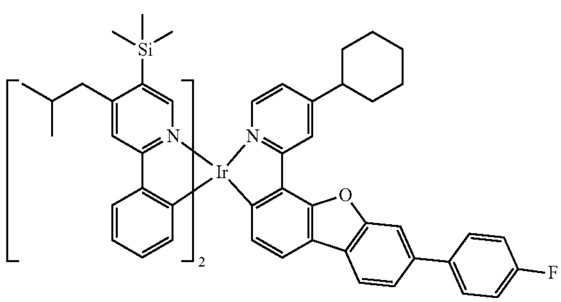
416
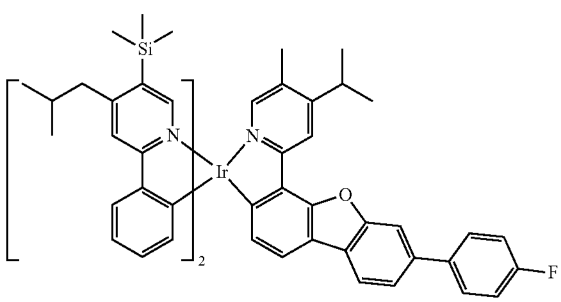
417
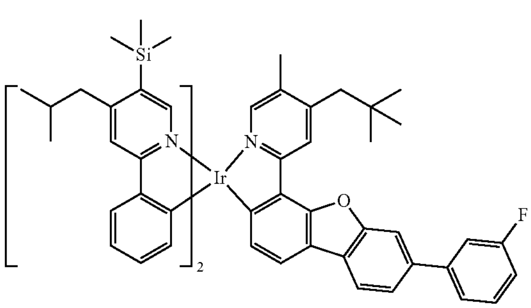
-continued
418
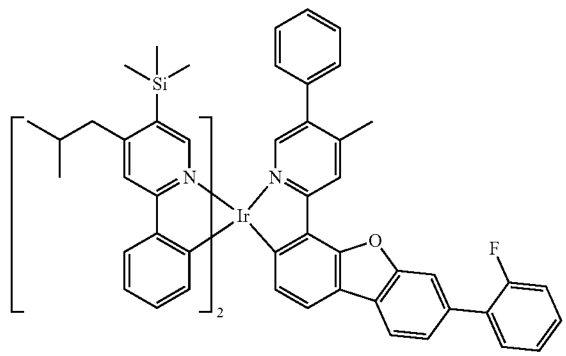
419
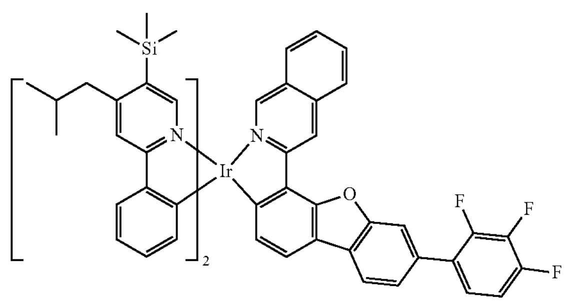
420
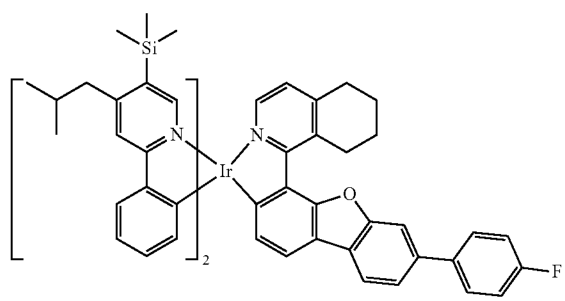
421
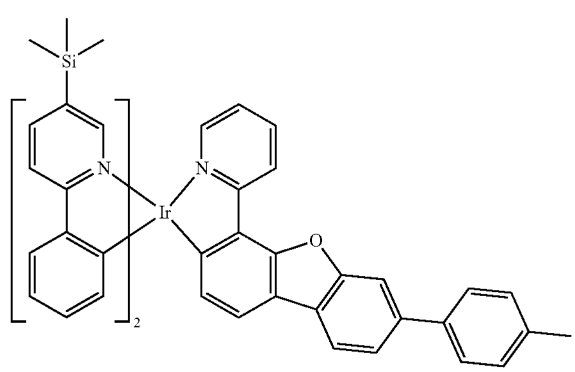

-continued
422
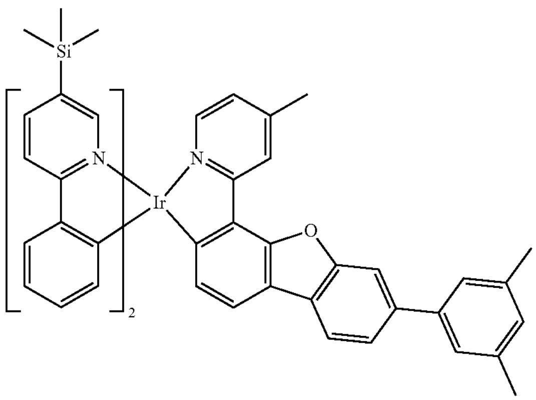
423
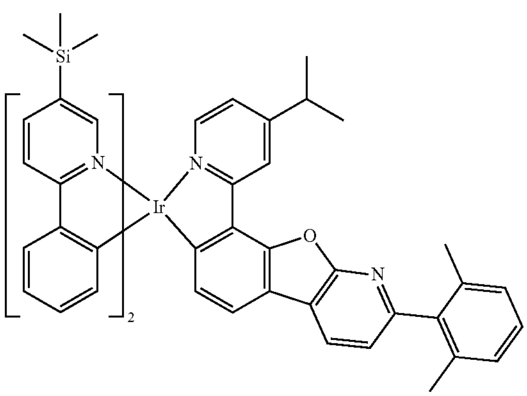
424
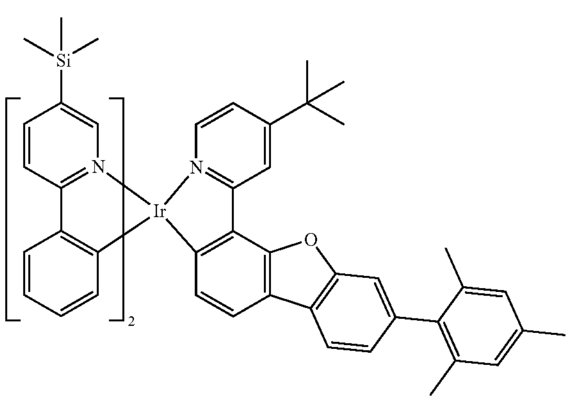
-continued
425
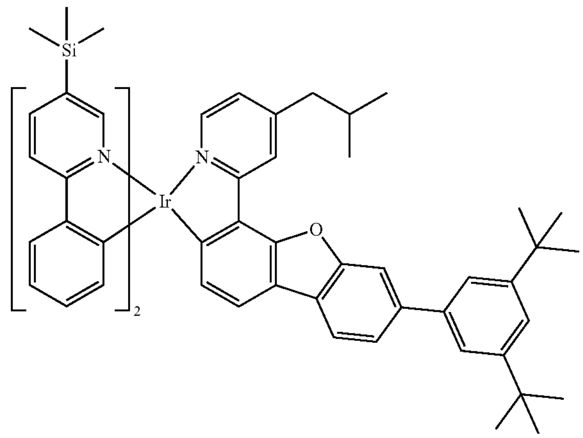
426
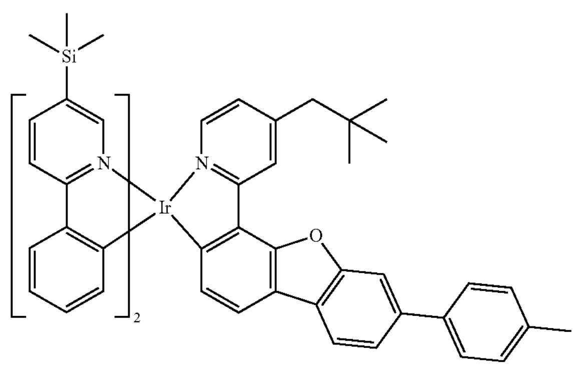
427
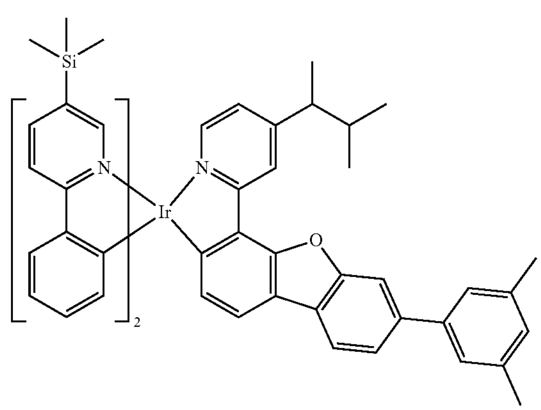

-continued
428
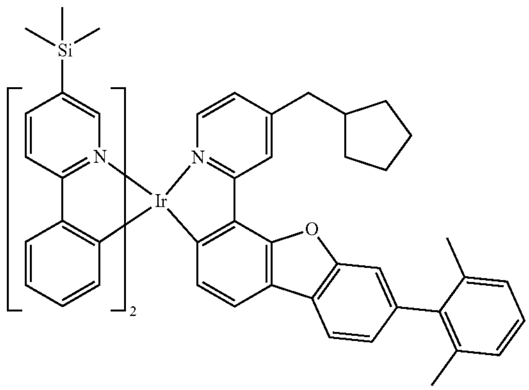
429
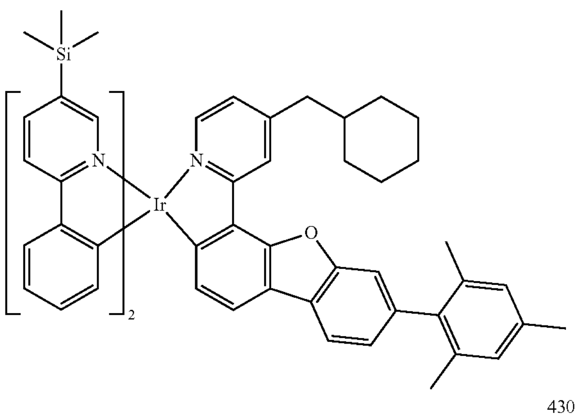
430
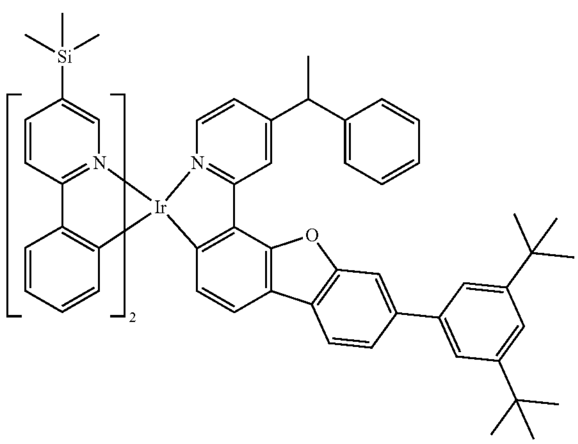
431
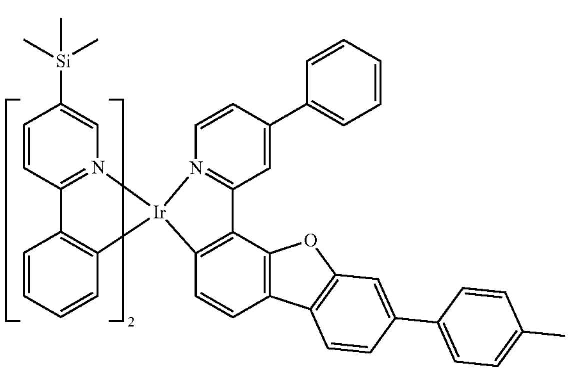
-continued
432
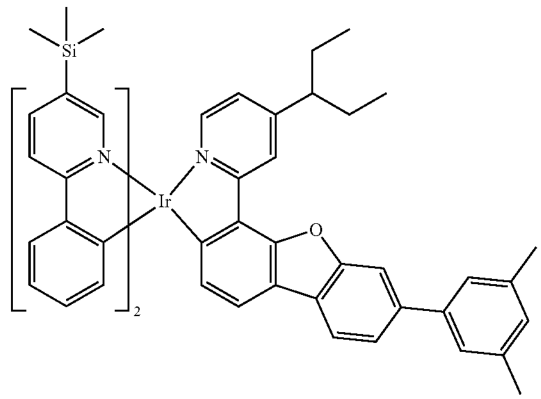
433
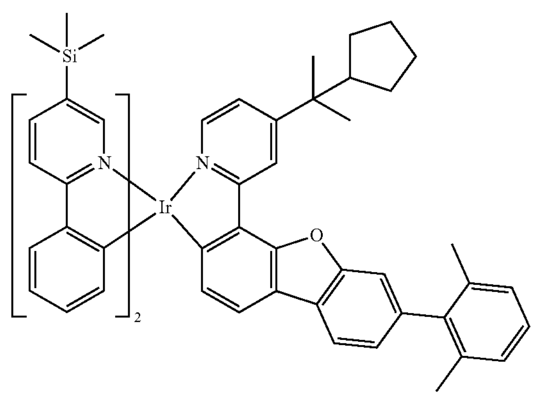
434
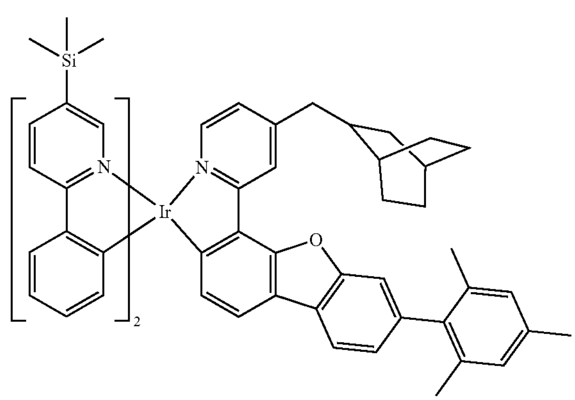

-continued
435
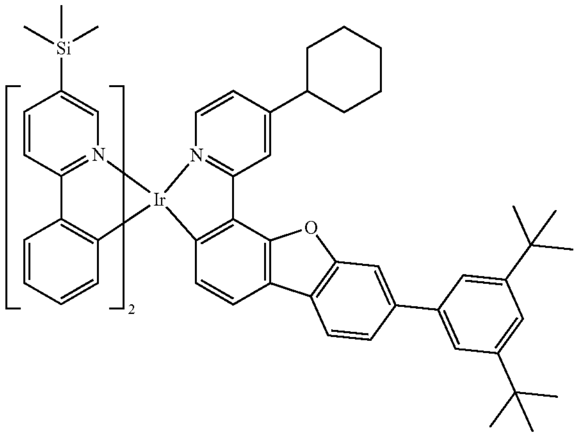
436
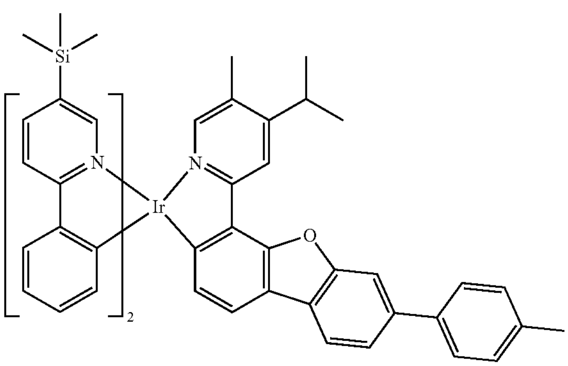
437
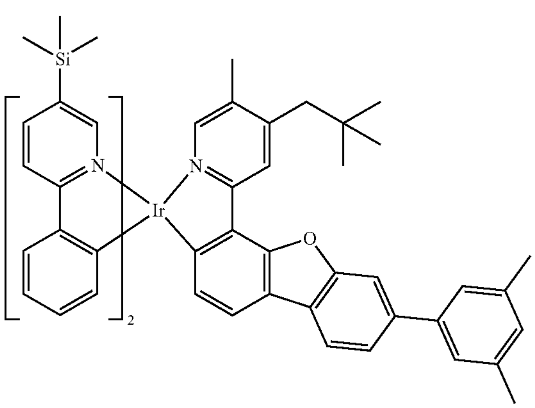
-continued
438
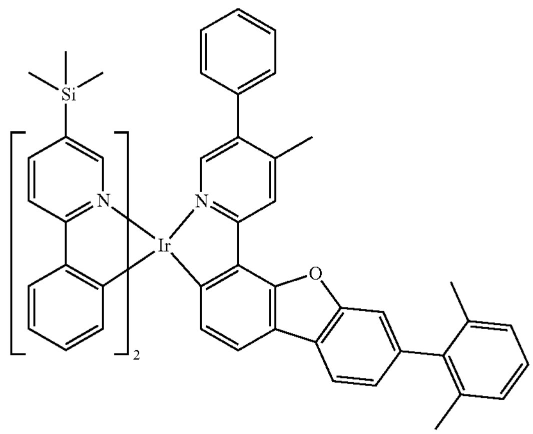
439
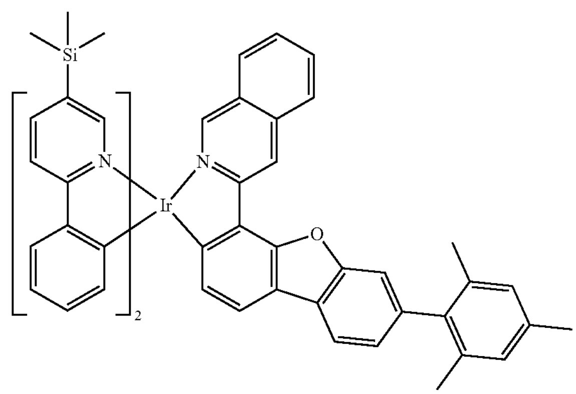
440
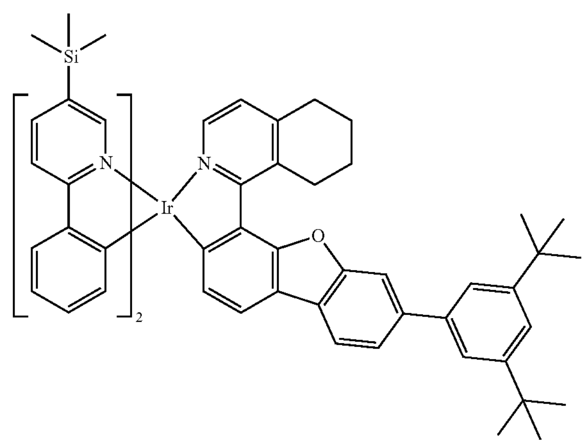
441
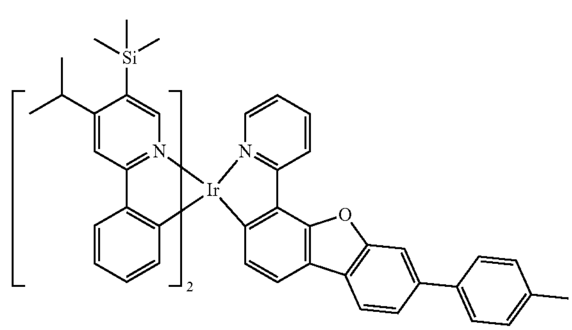

-continued
442
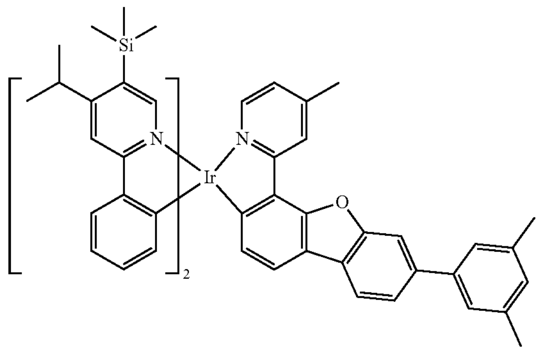
443
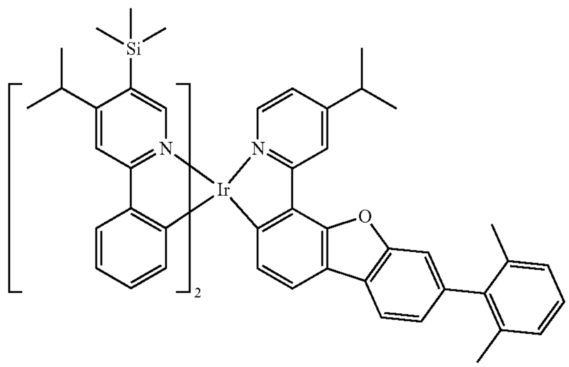
444
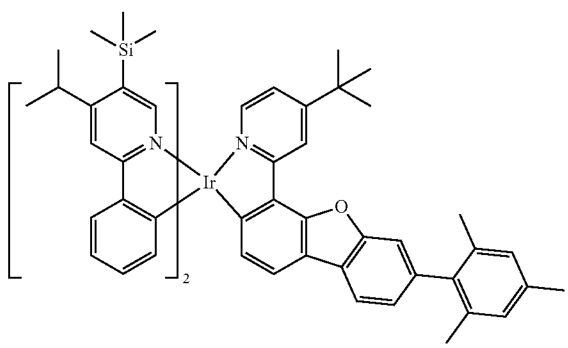
445
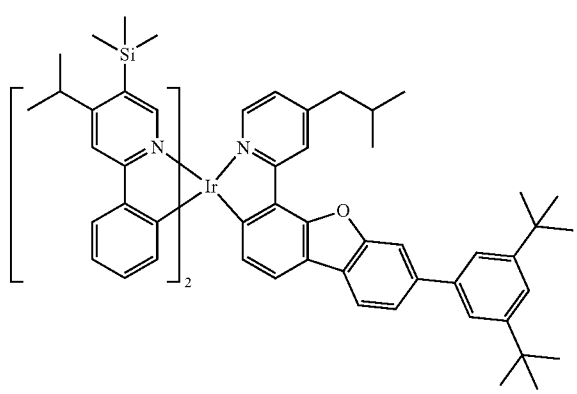
-continued
446
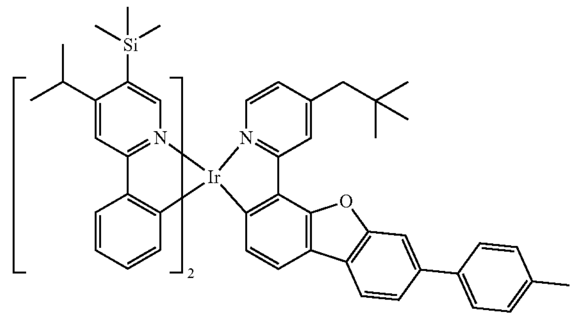
447
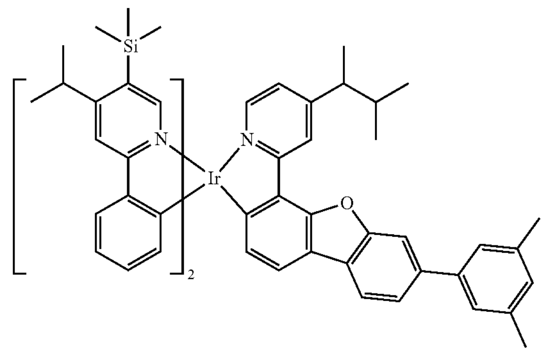
448
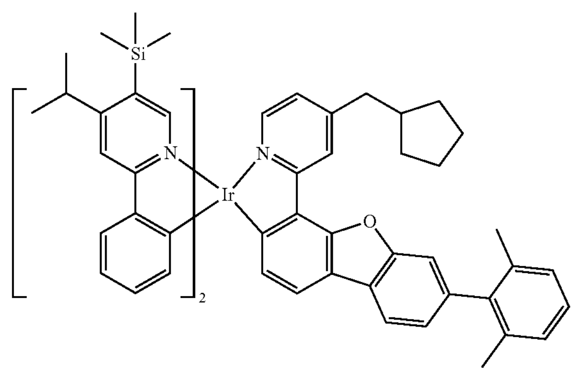
449
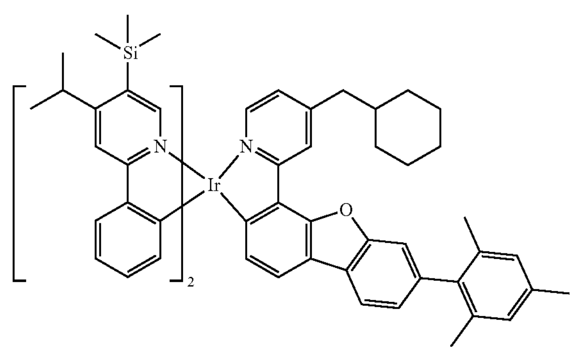

-continued
450
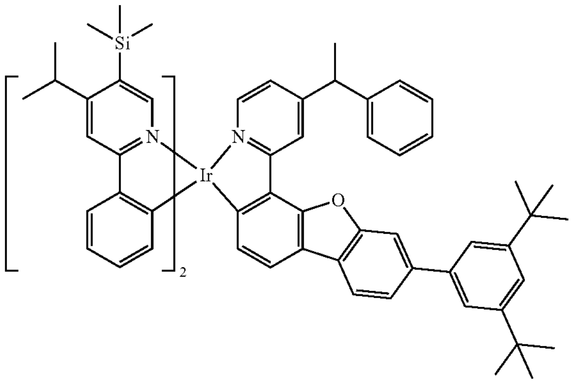
451
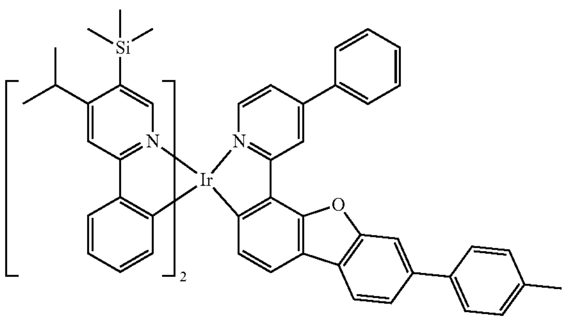
452
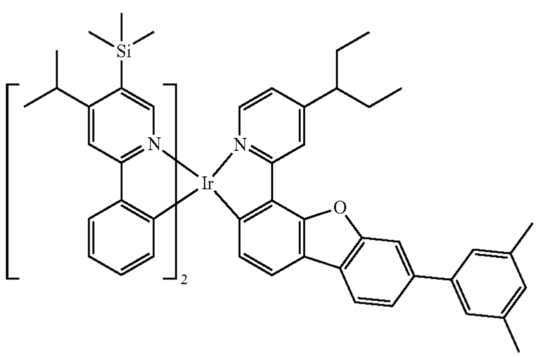
453
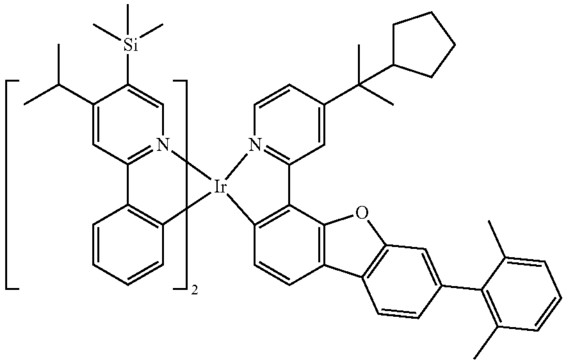
-continued
454
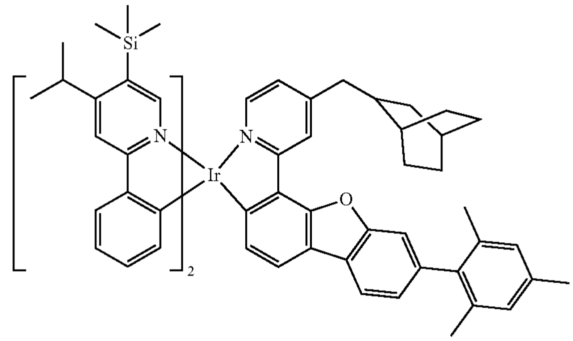
455
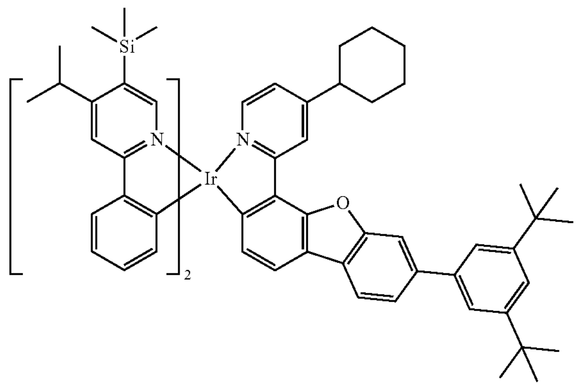
456
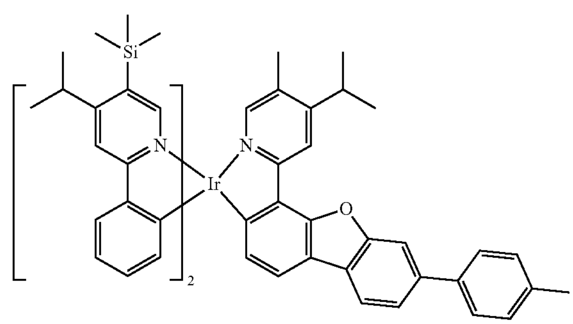
457
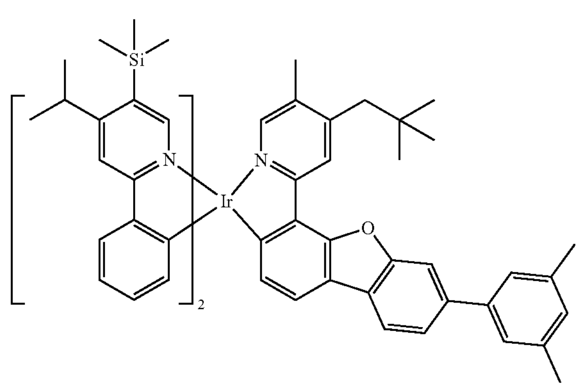

-continued
458
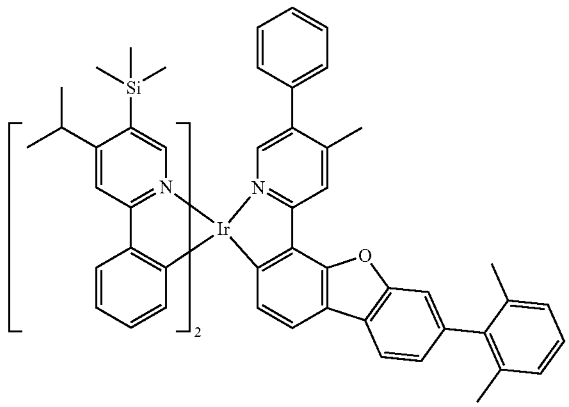
459
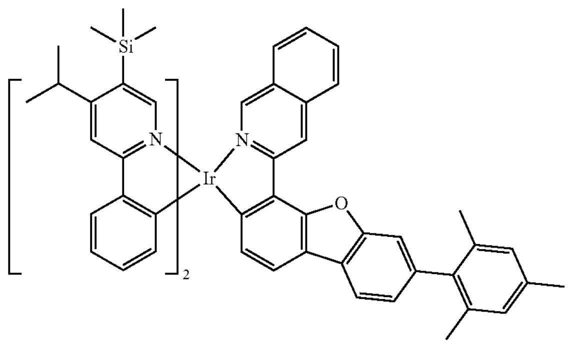
460
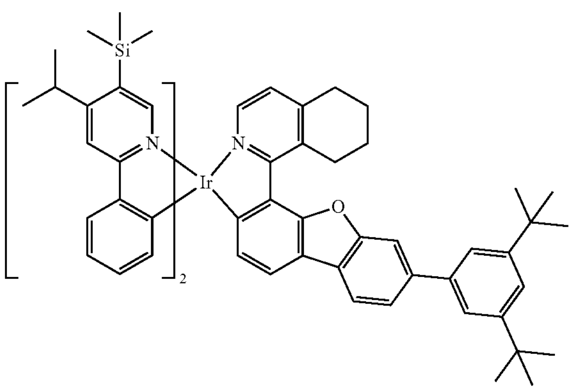
461
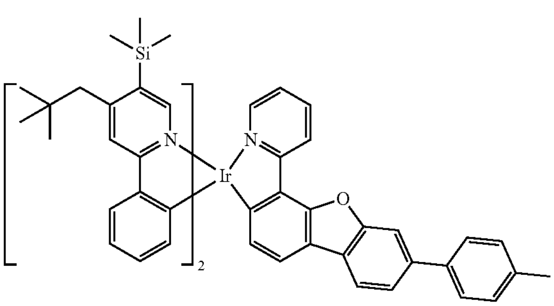
-continued
462
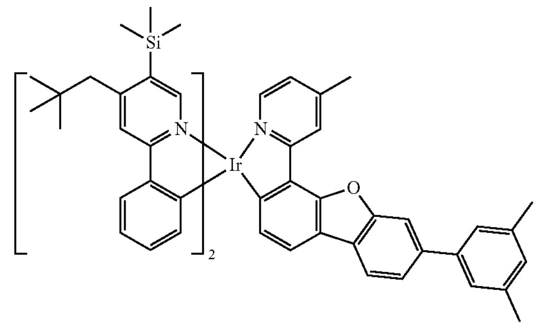
463
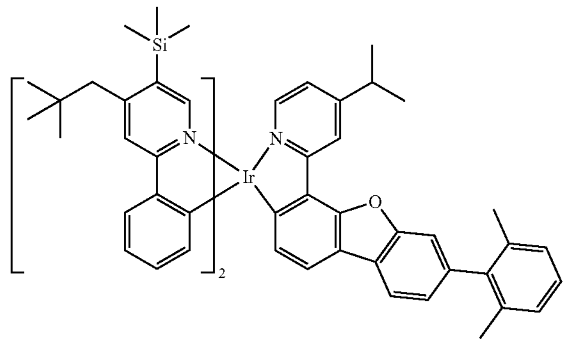
464
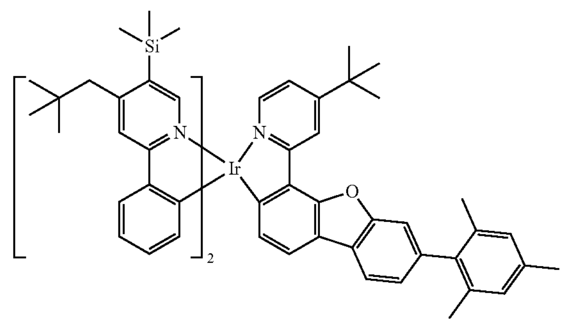
465
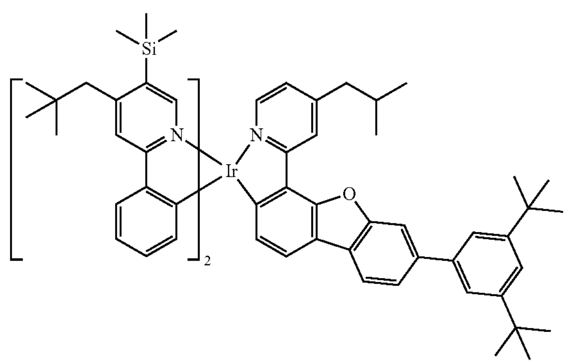

-continued
466
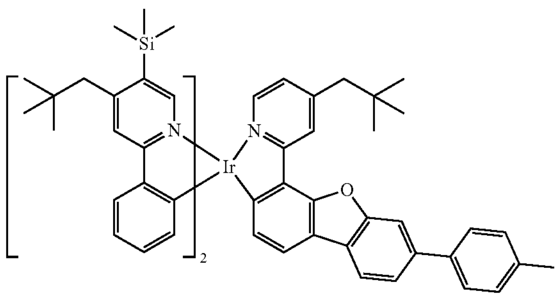
467
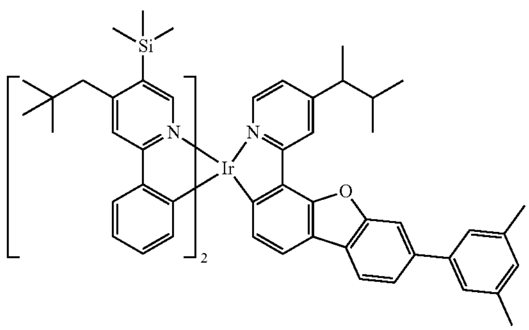
468
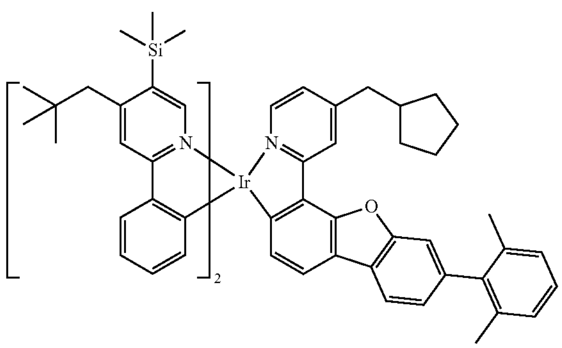
469
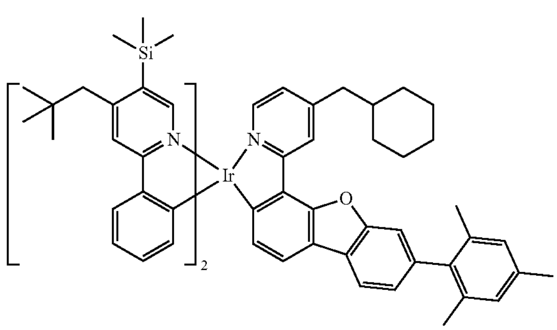
-continued
470
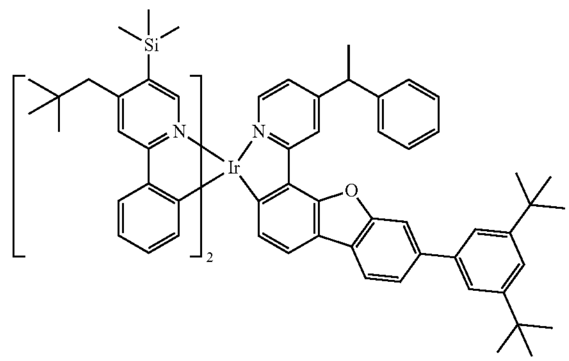
471
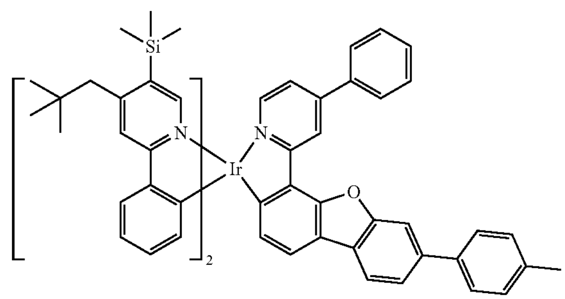
472
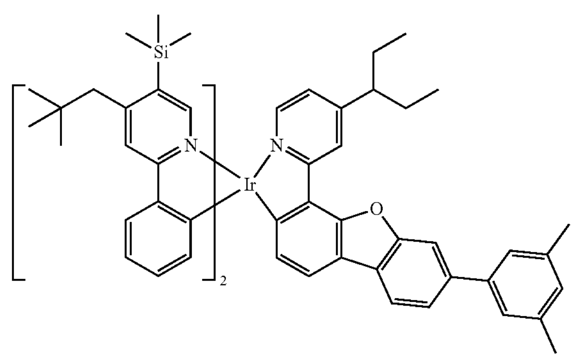
473
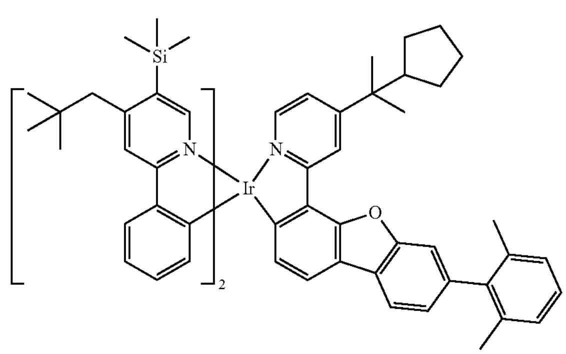

-continued
474
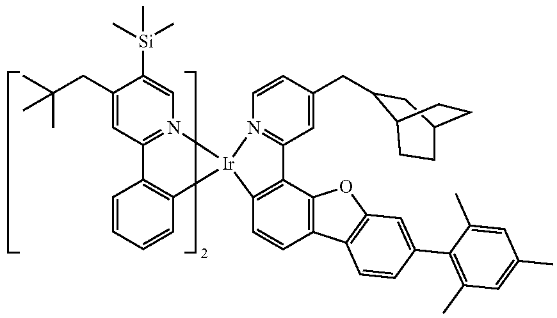
475
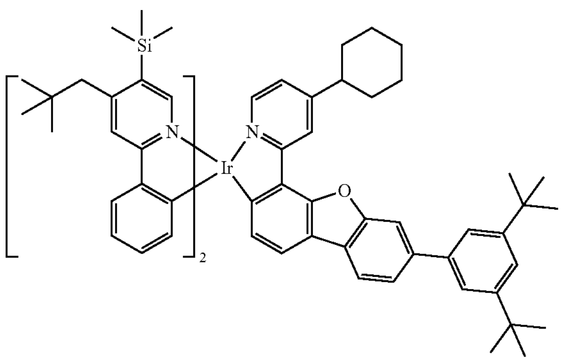
476
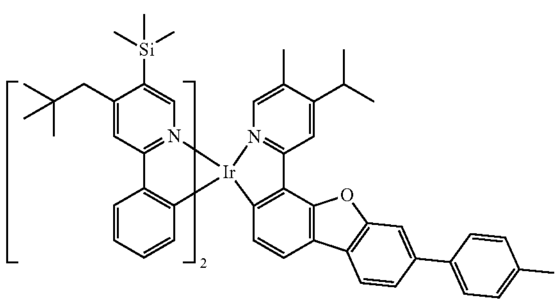
477
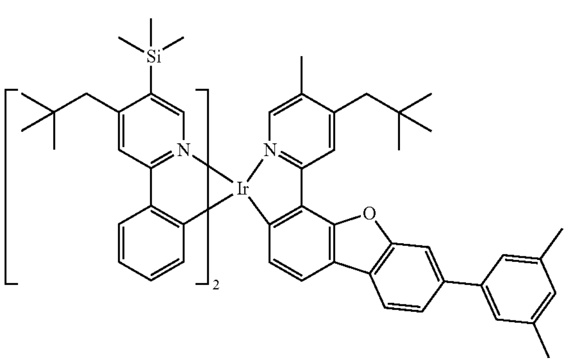
-continued
478
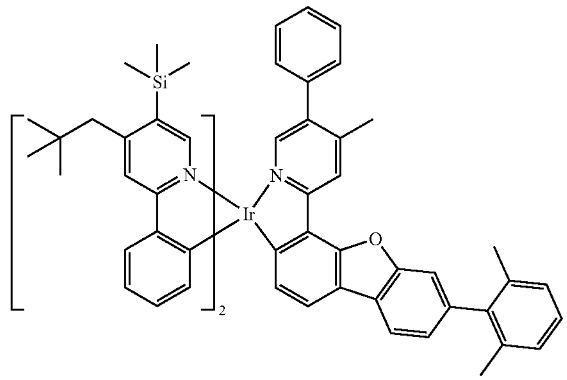
479
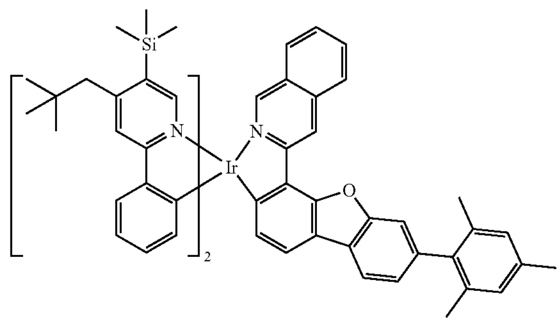
480
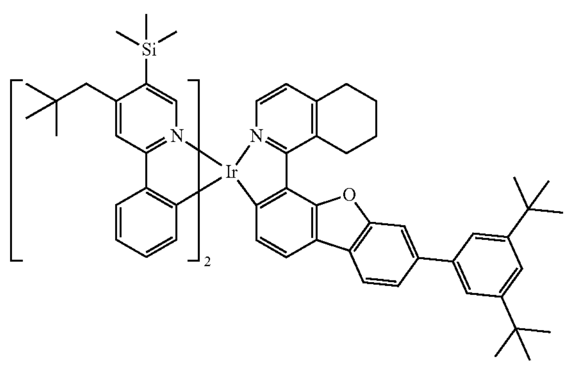
481
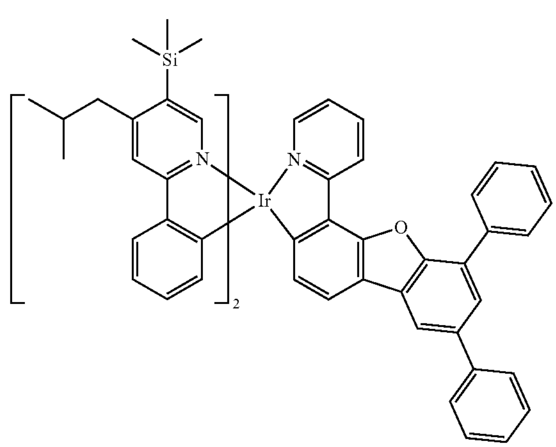

-continued
482
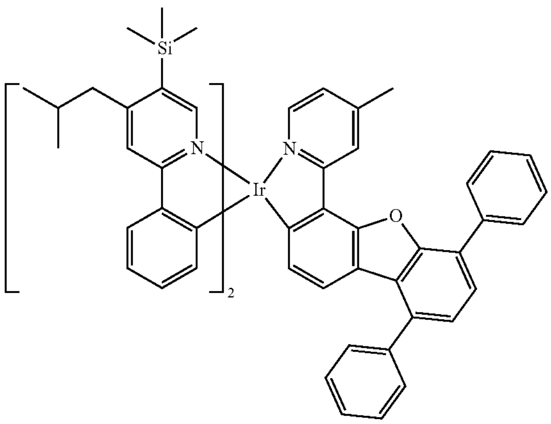
483
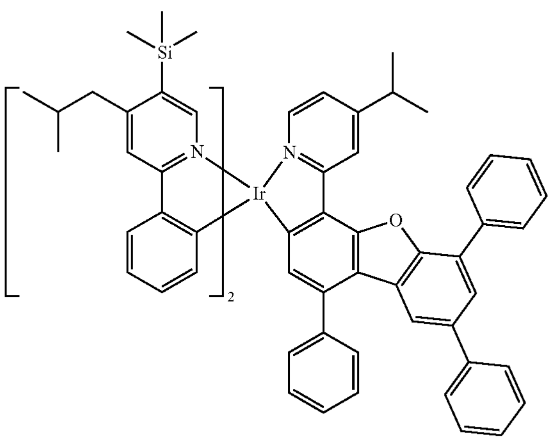
484
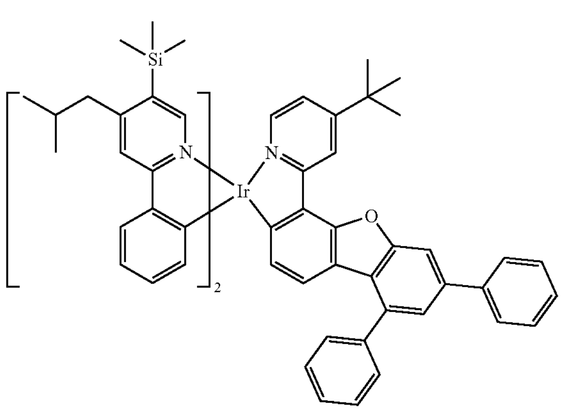
-continued
485
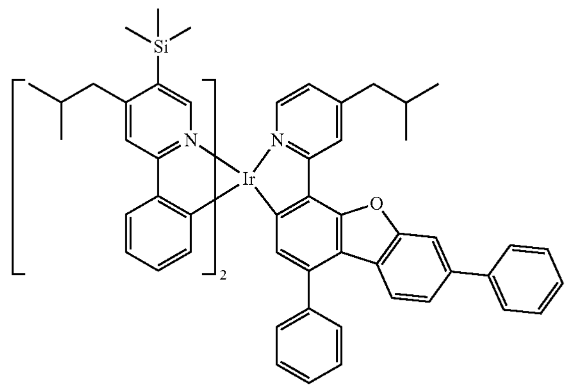
486
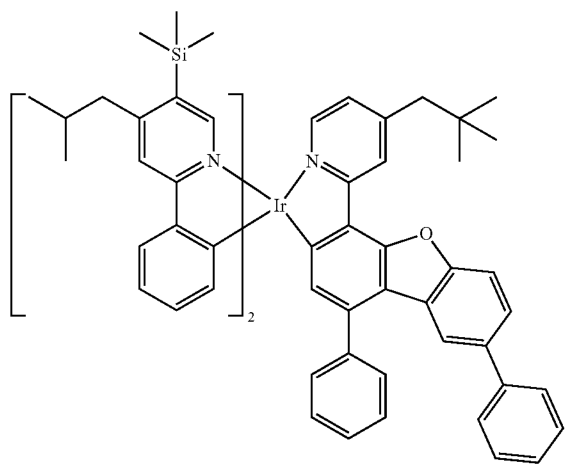
487
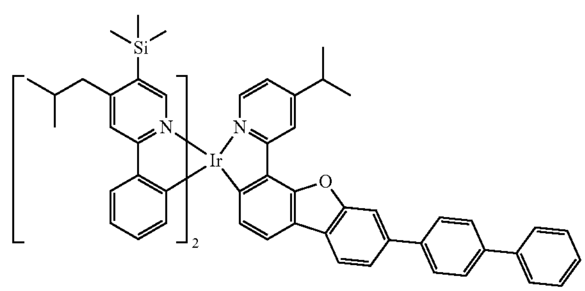
488
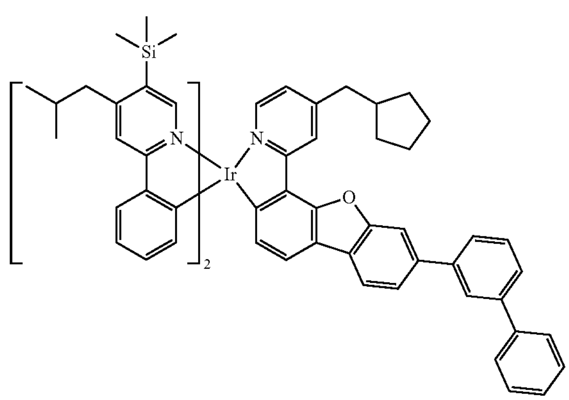

489
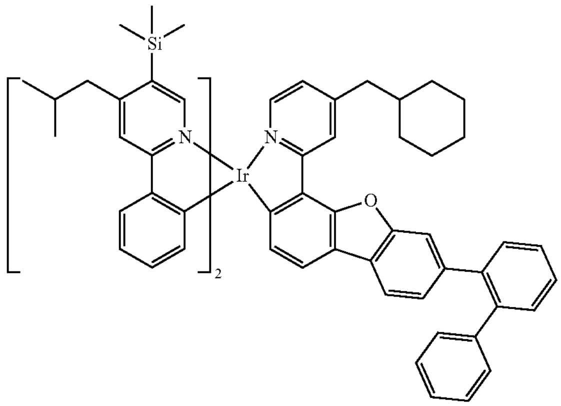
490
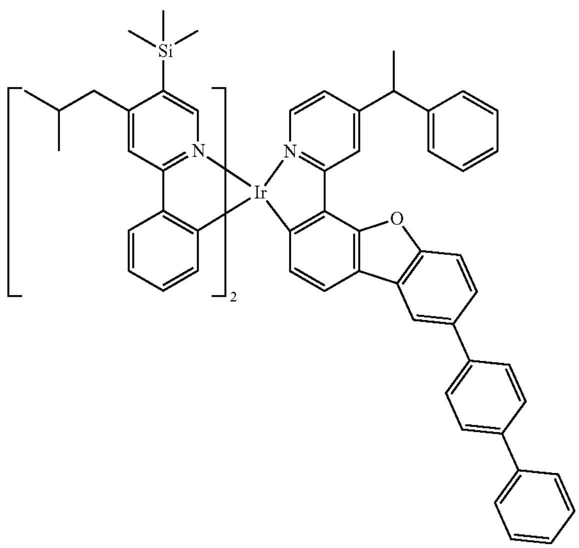
491
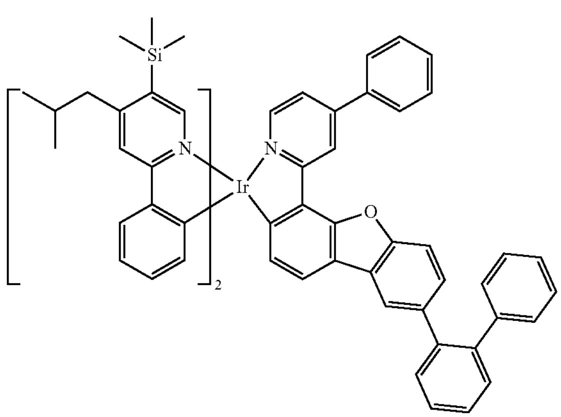
492
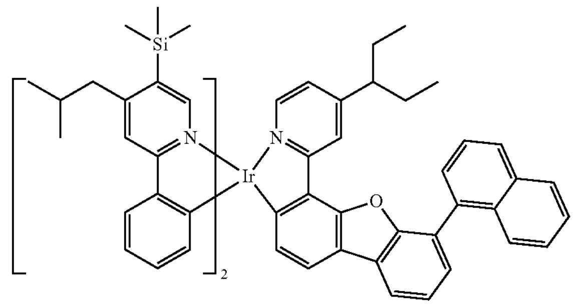
493
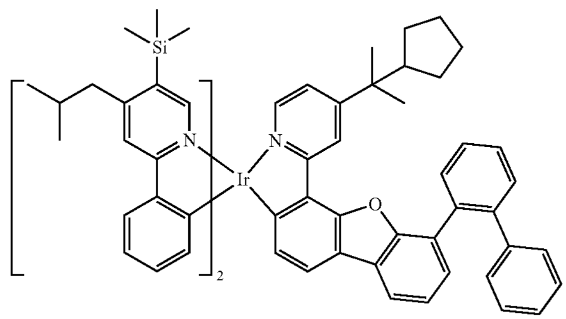
494
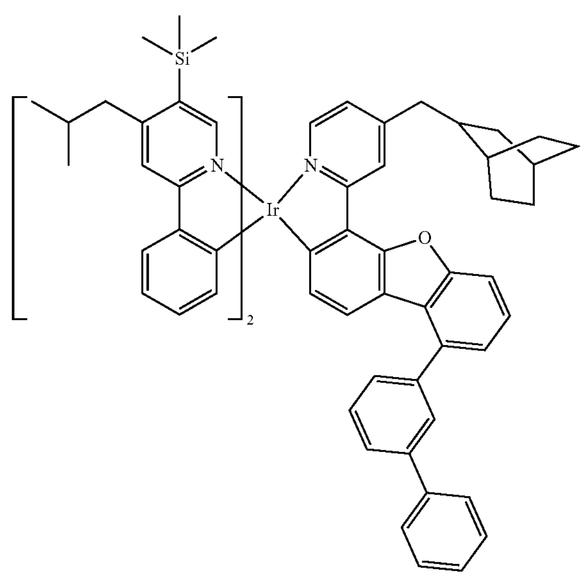

-continued
495
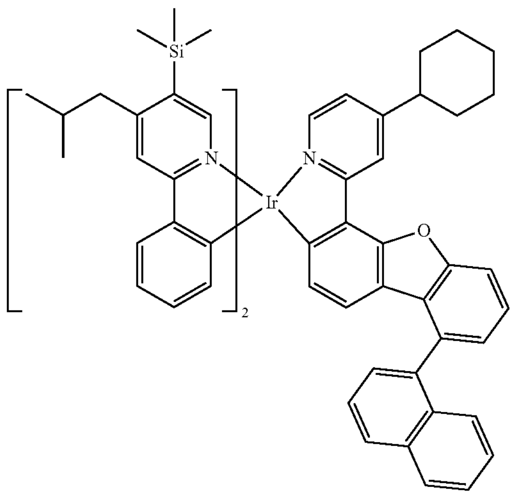
496
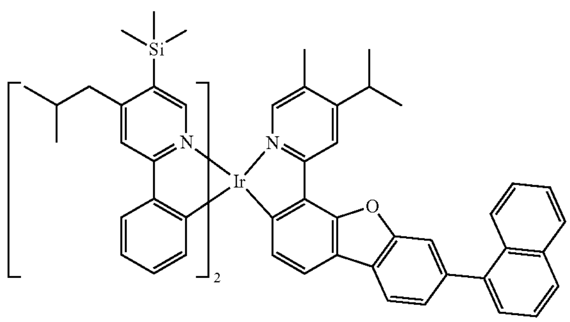
497
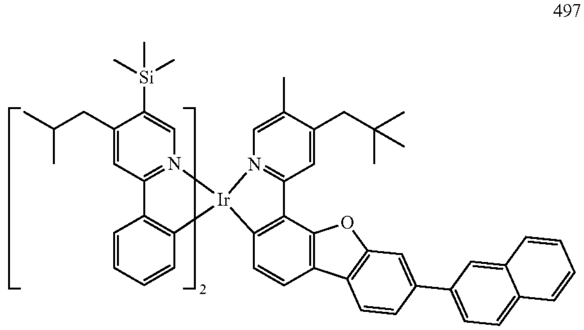
498
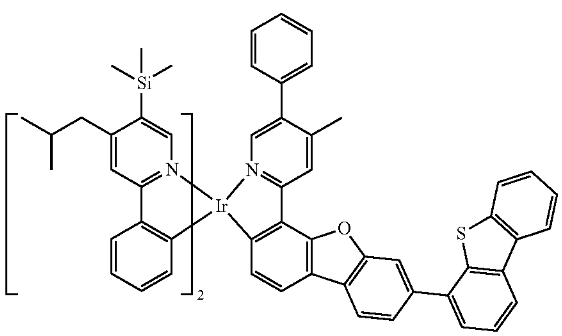
-continued
499
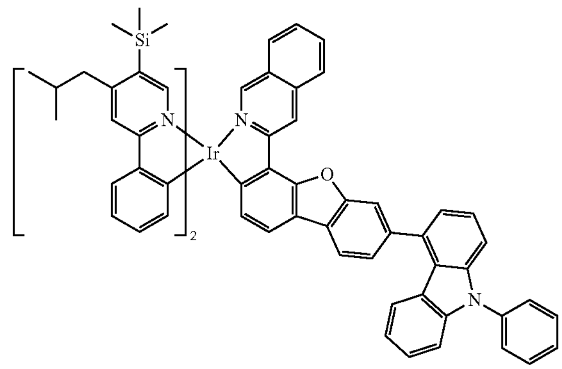
500
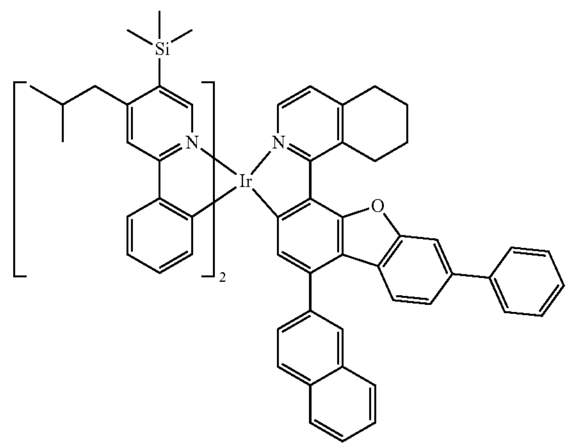
501
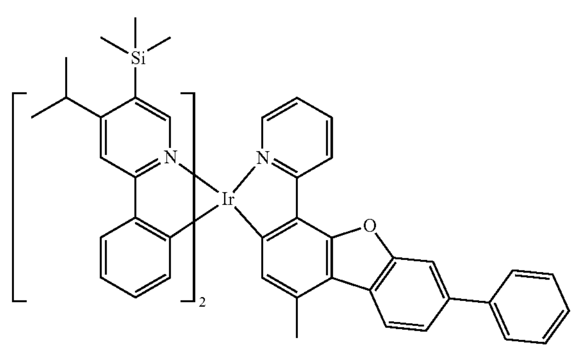
502
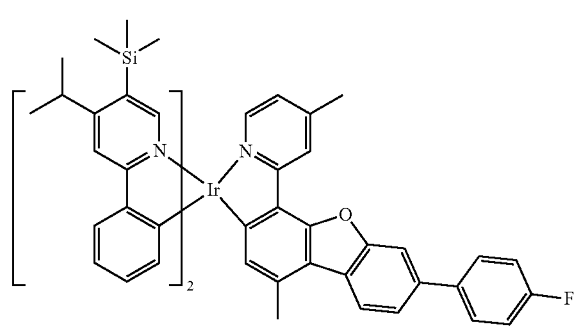

-continued
503
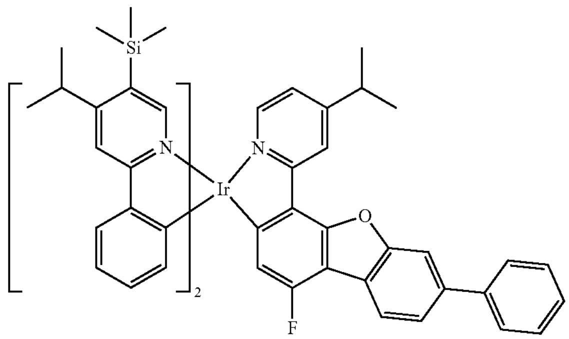
504
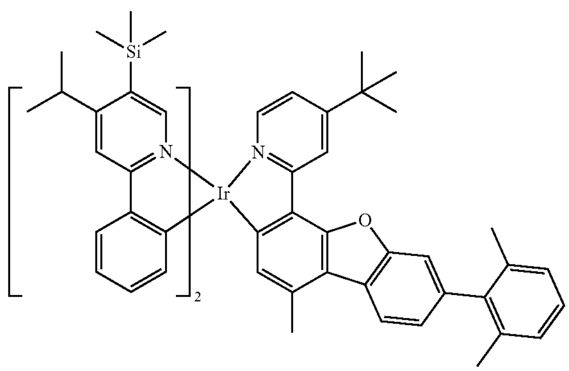
505
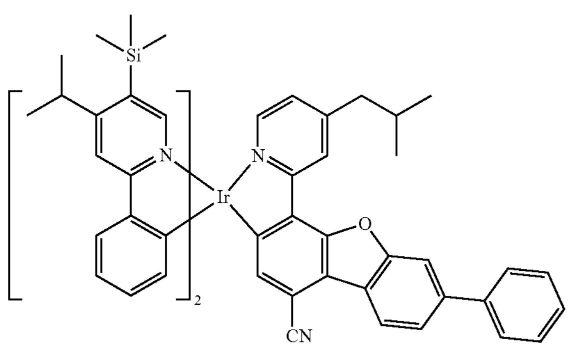
506
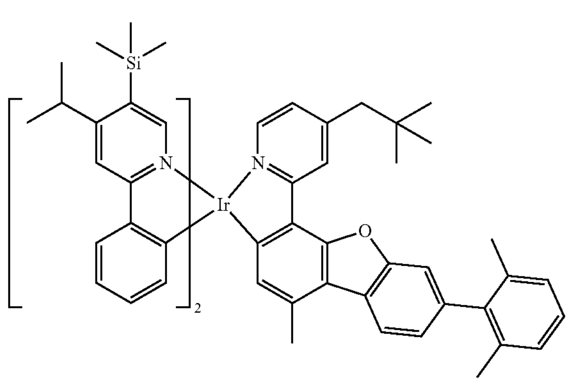
-continued
507
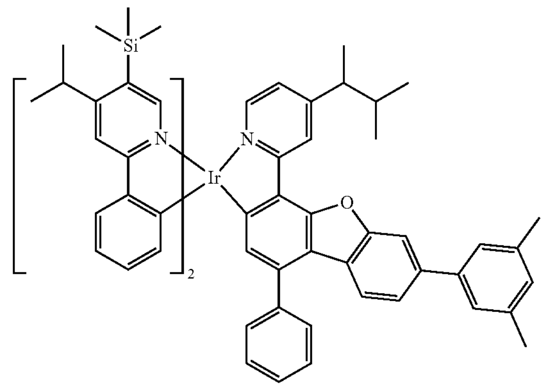
508
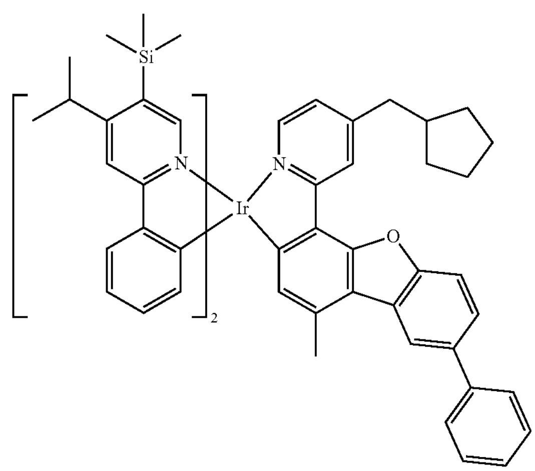
509
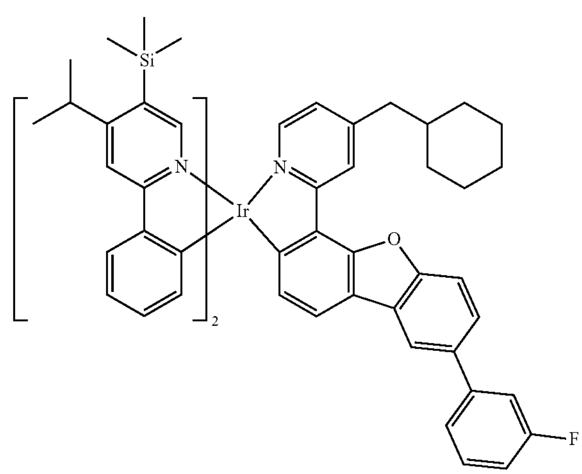

-continued
510
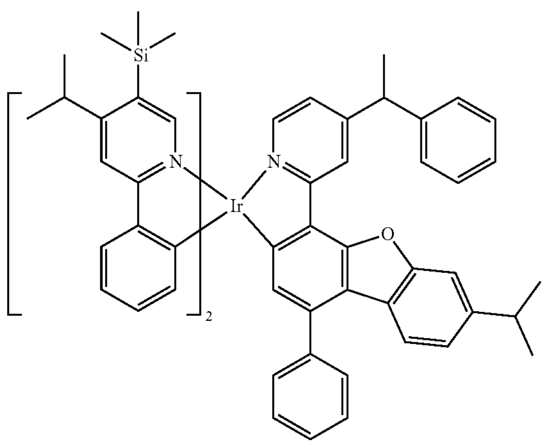
511
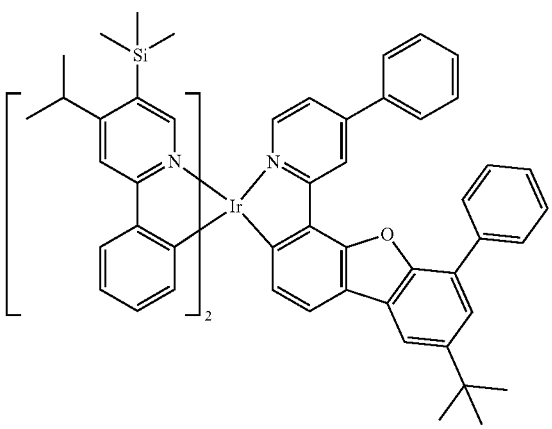
512
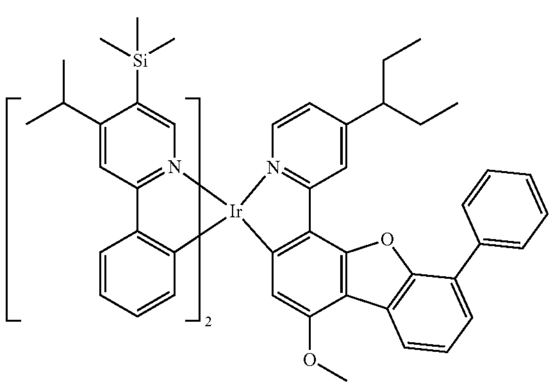
-continued
513
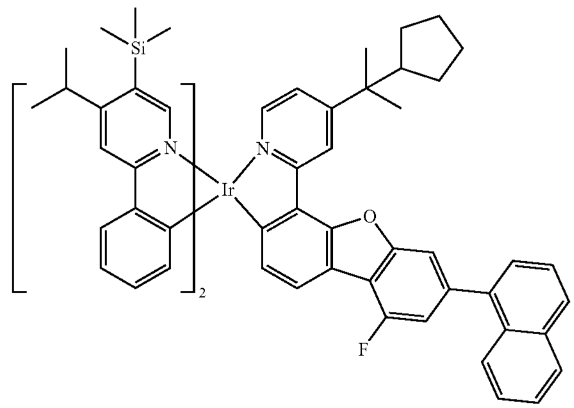
514
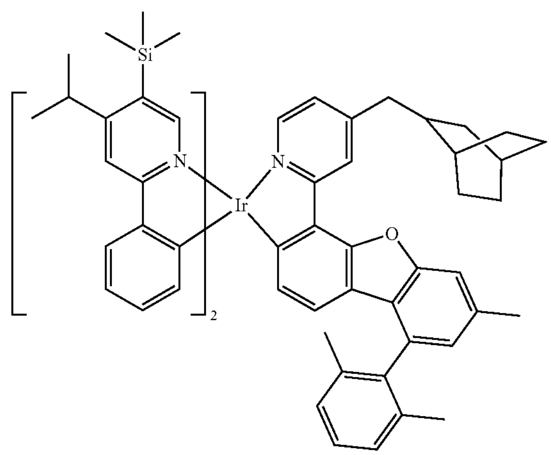
515
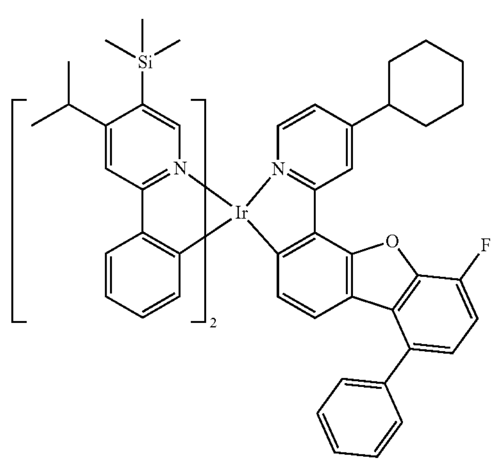

516
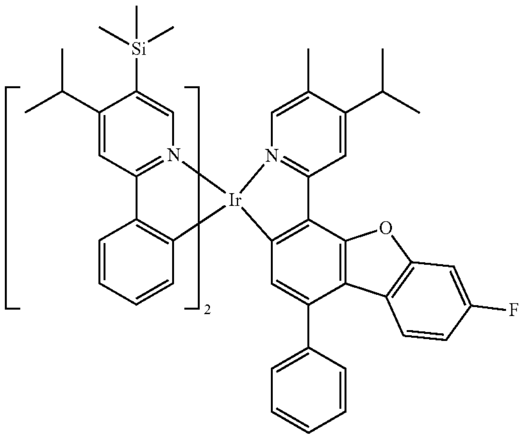
517
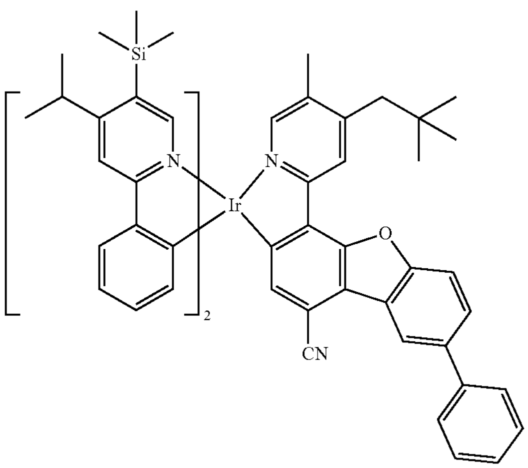
518
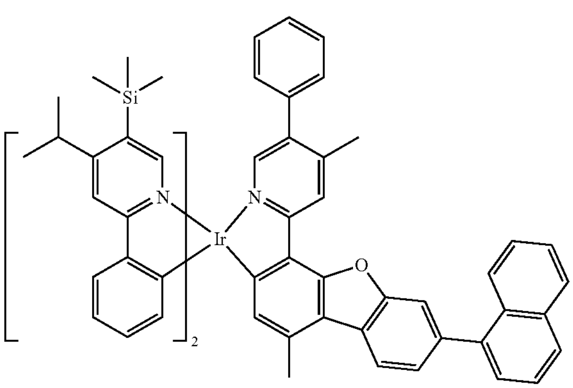
519
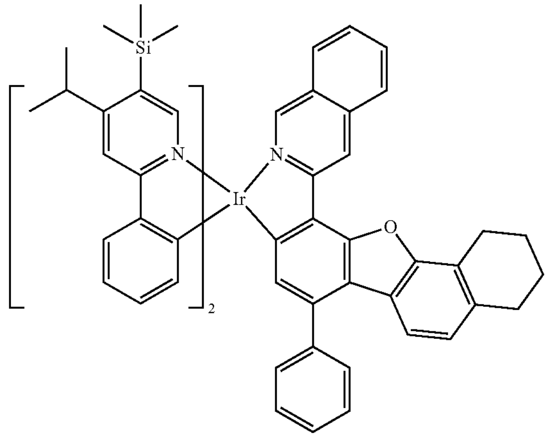
520
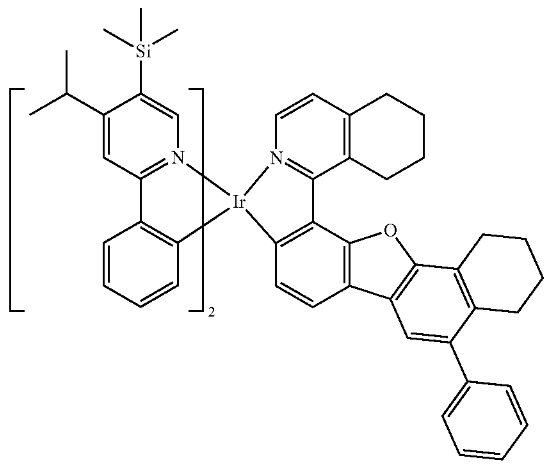
521
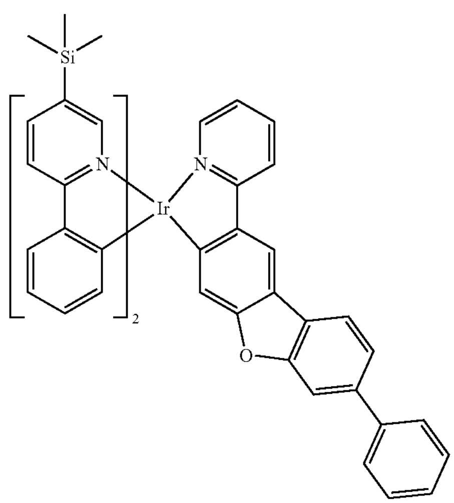

-continued
522
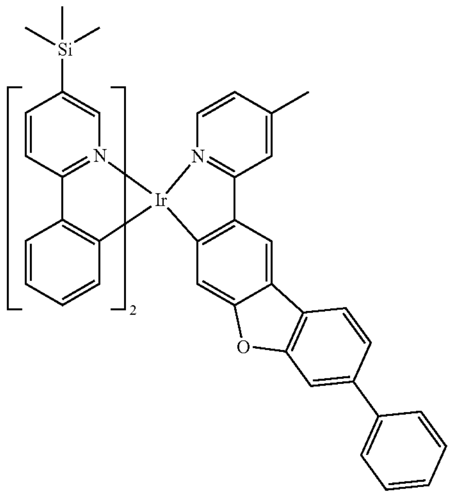
523
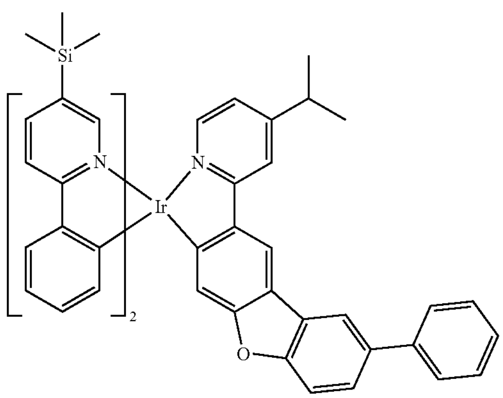
524
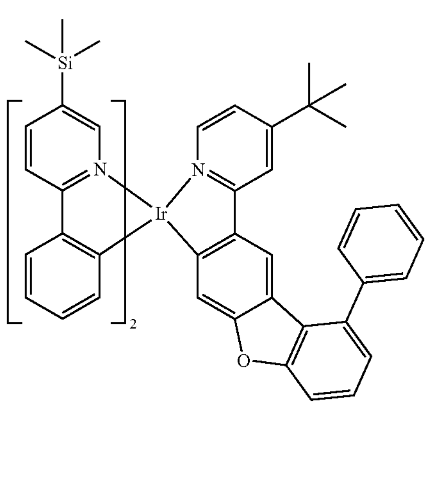
-continued
525
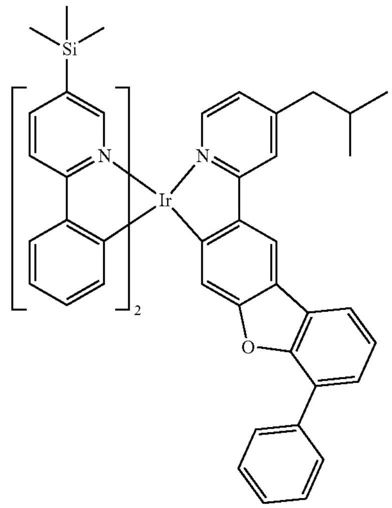
526
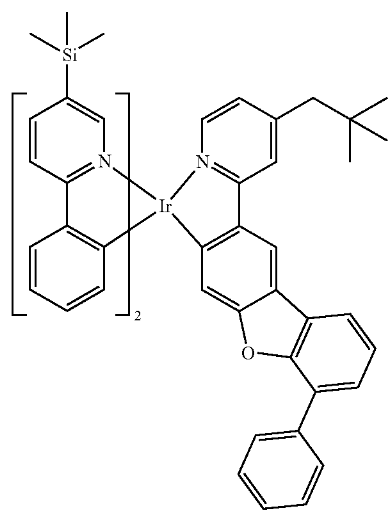
527
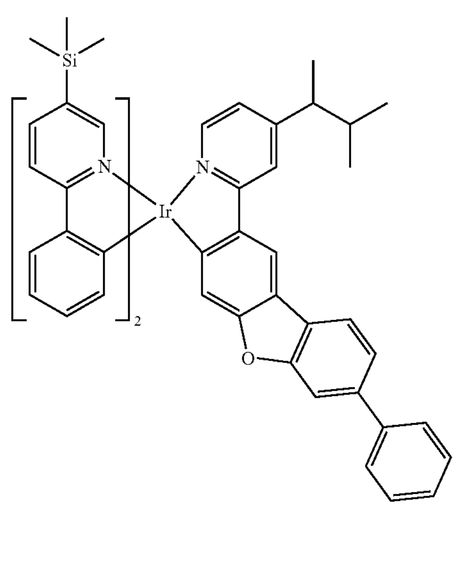

528
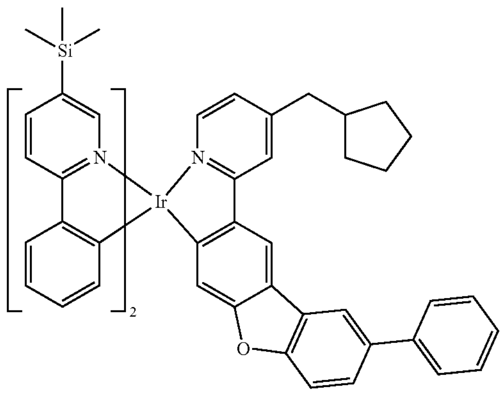
529
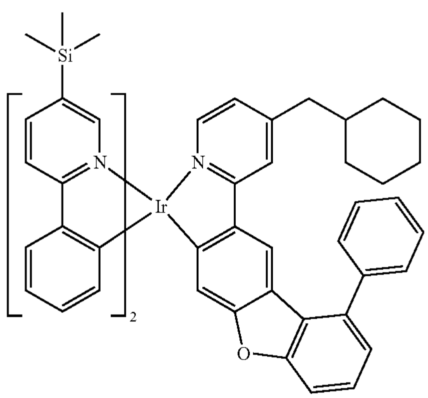
530
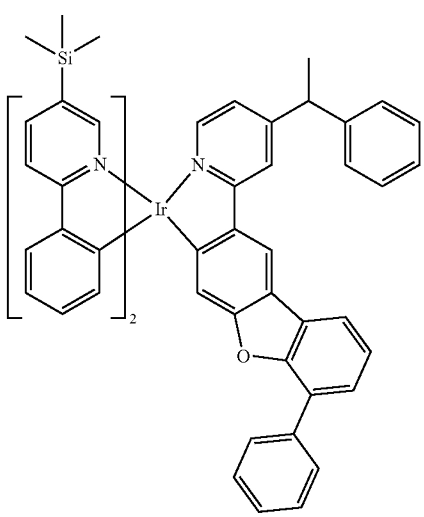
531
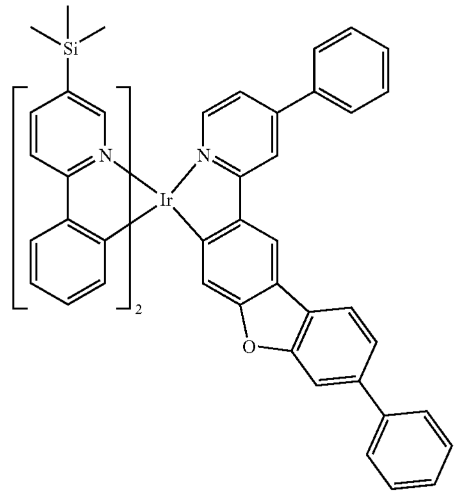
532
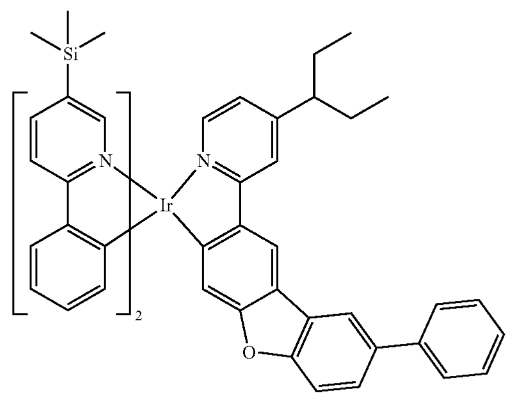
533
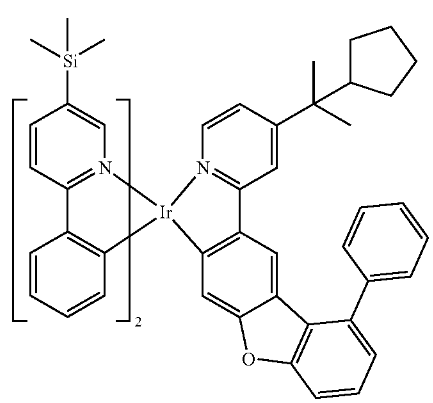

-continued
534
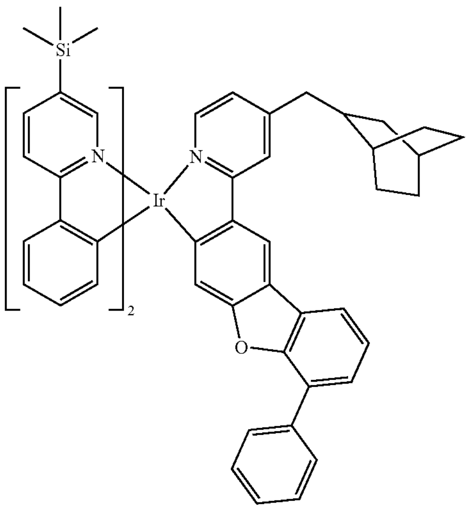
535
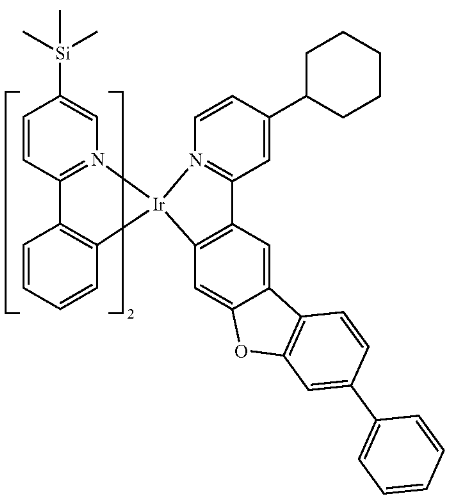
536
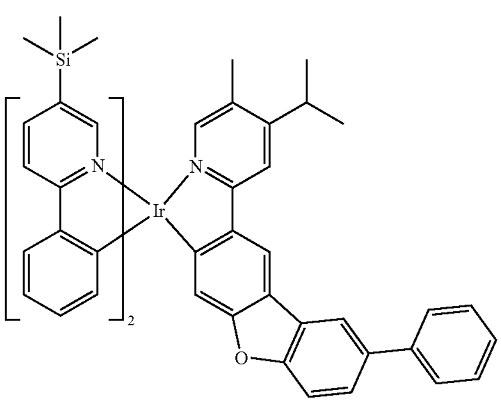
-continued
537
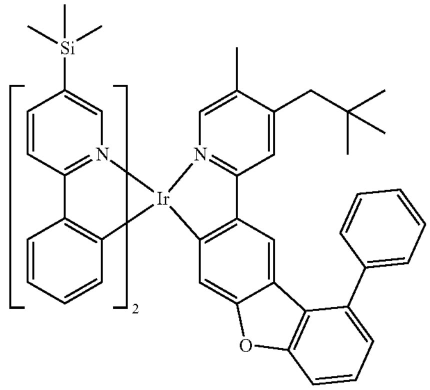
538
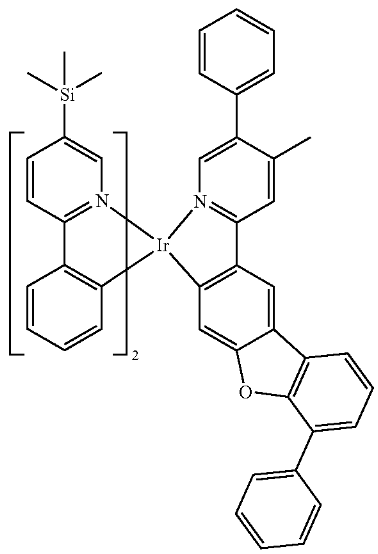
539
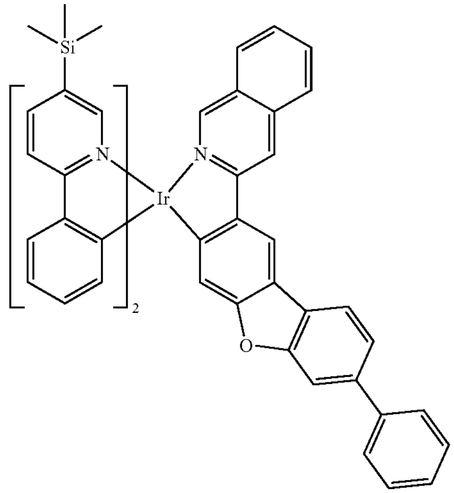

-continued
540
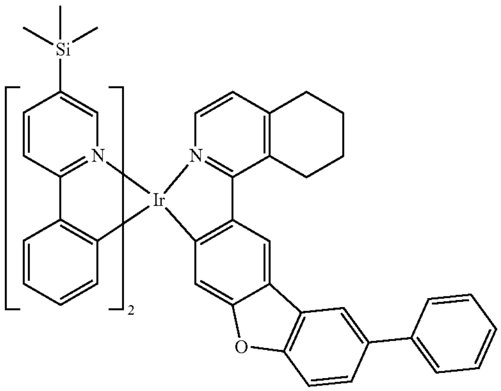
541
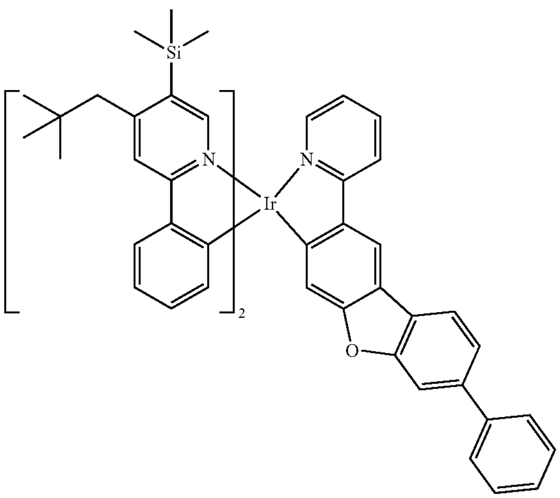
542
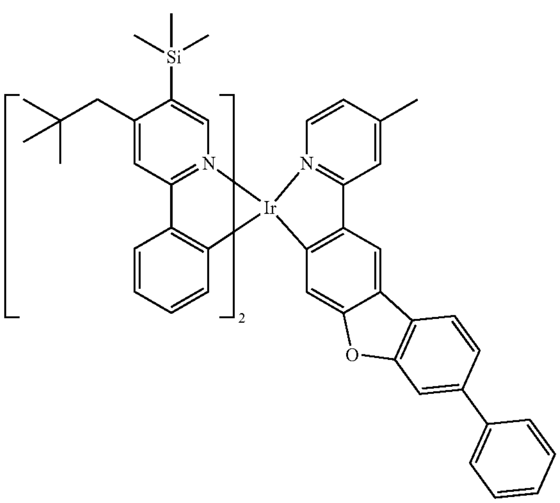
-continued
543
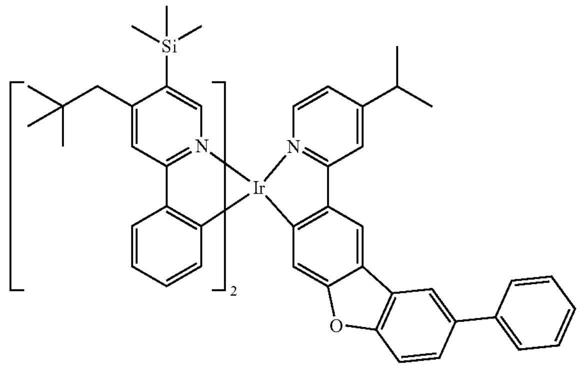
544
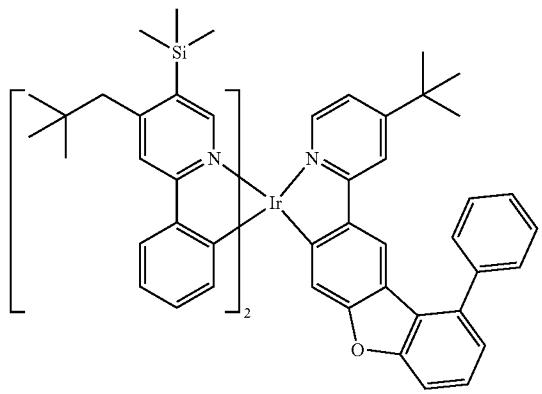
545
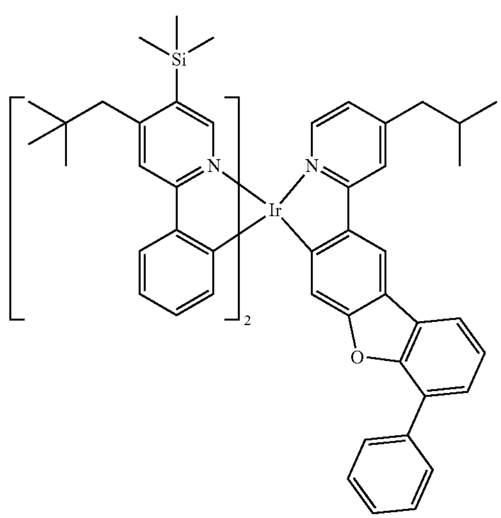

546
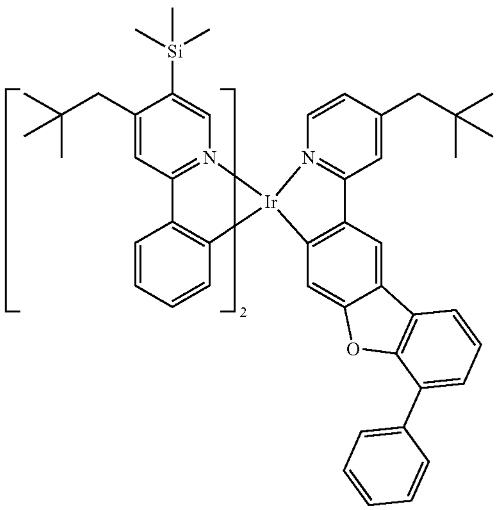
547
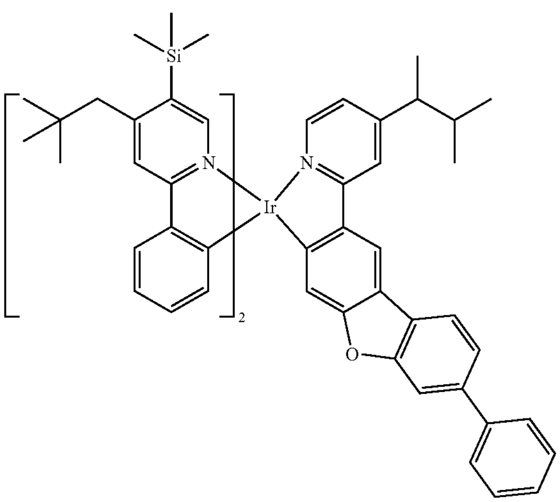
548
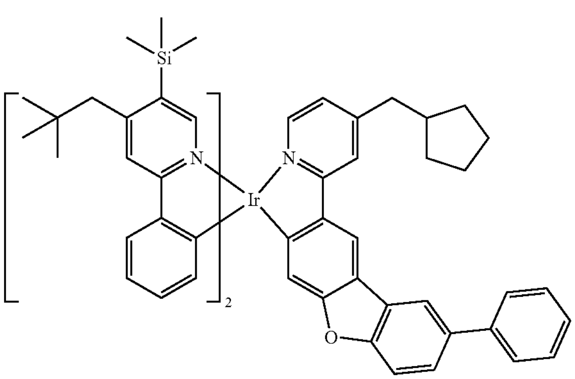
549
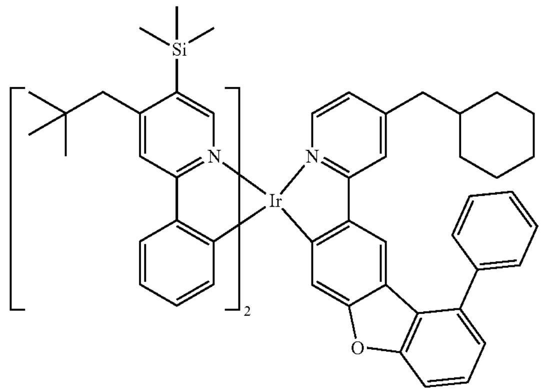
550
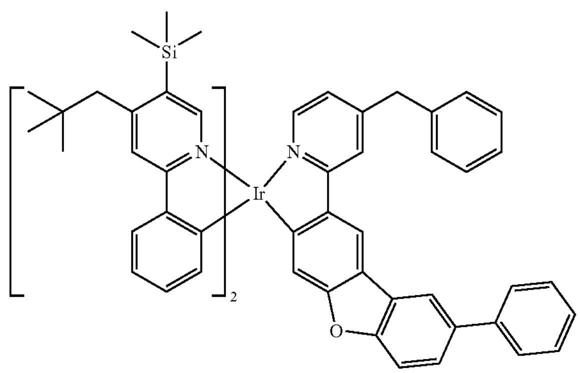
551
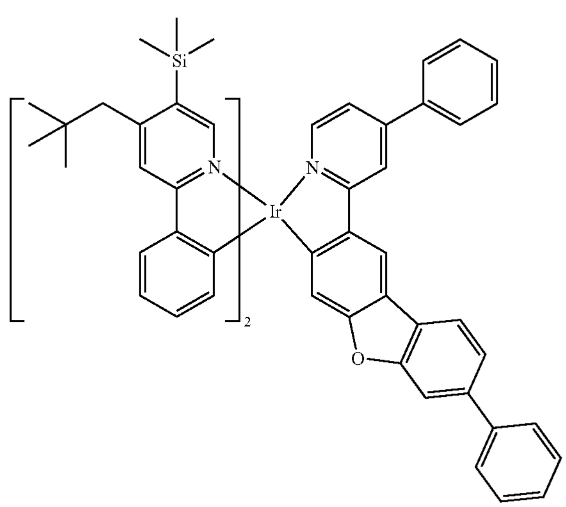

-continued
552
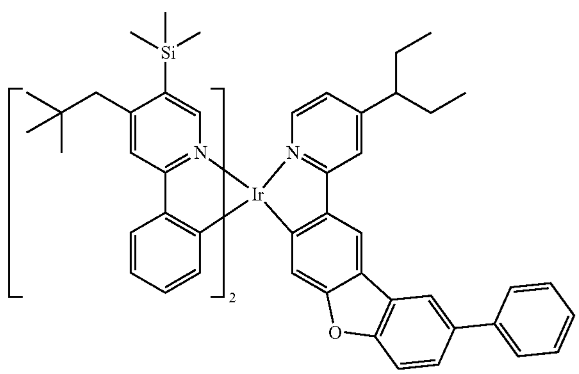
553
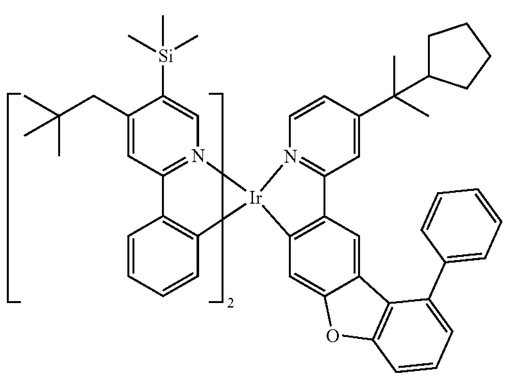
554
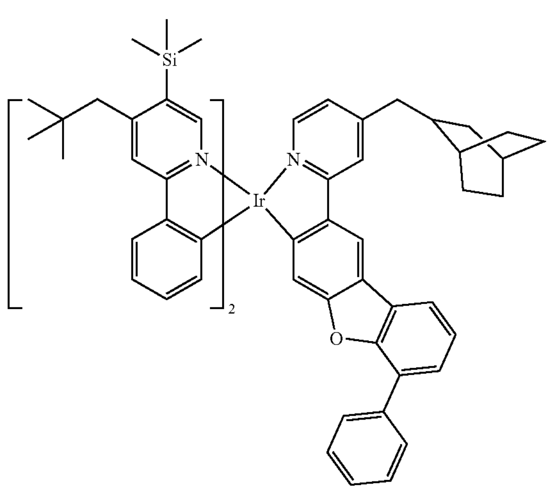
-continued
555
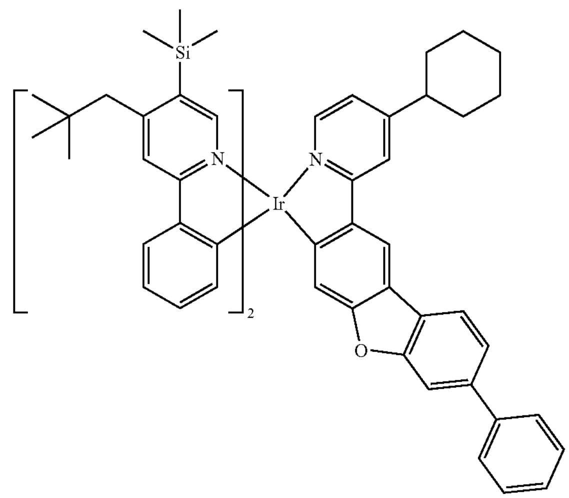
556
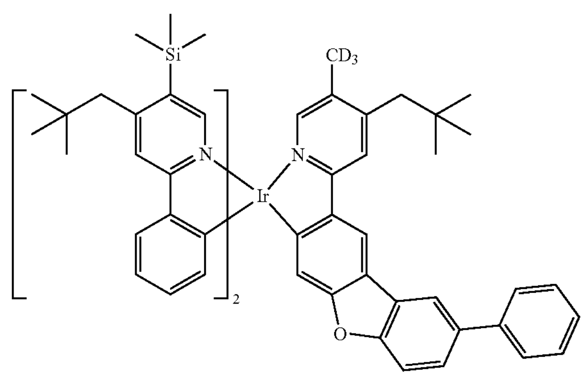
557
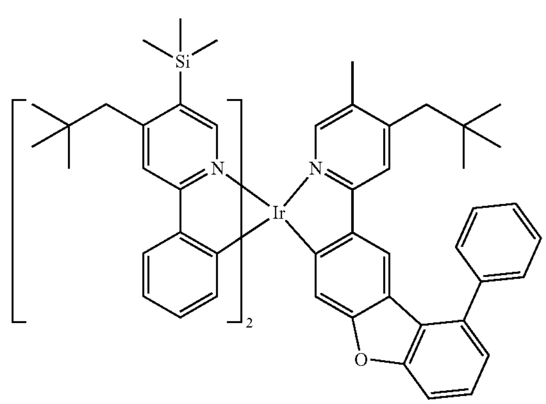

558
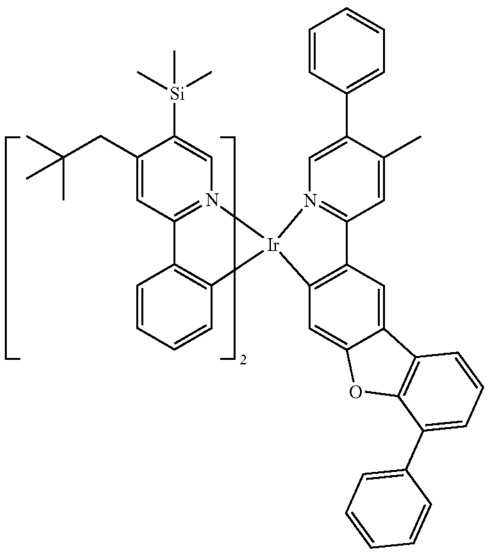
559
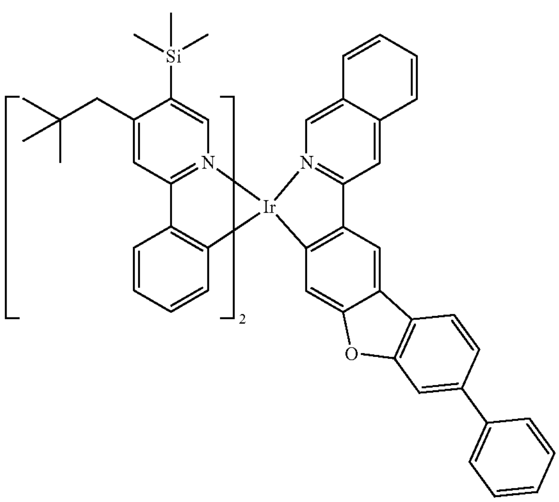
560
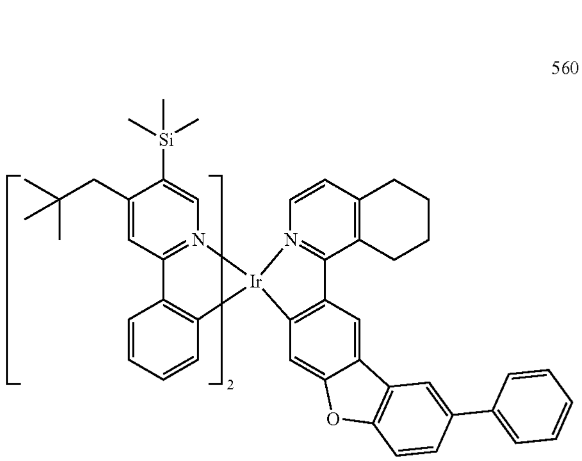
561
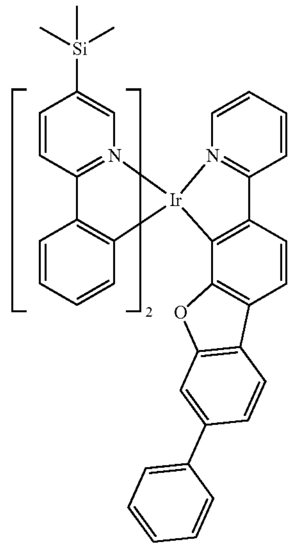
562
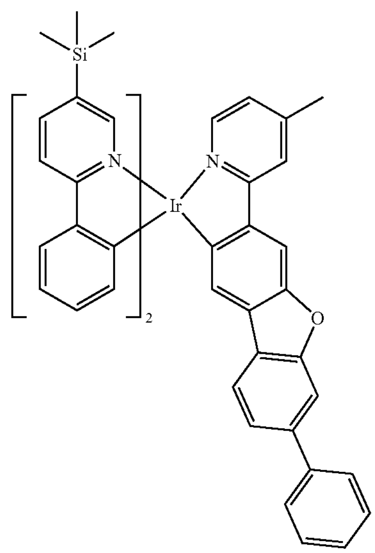
563
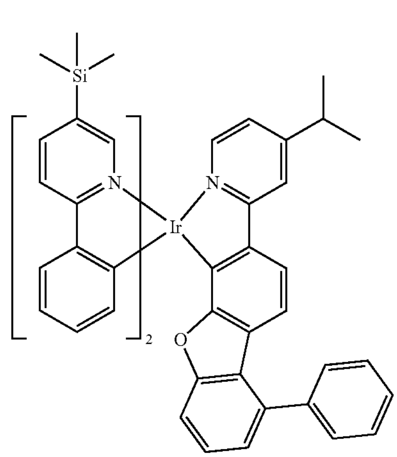

564
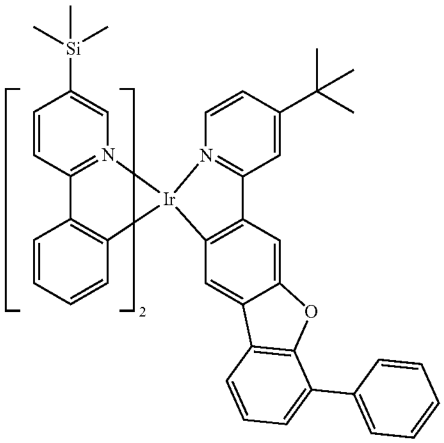
565
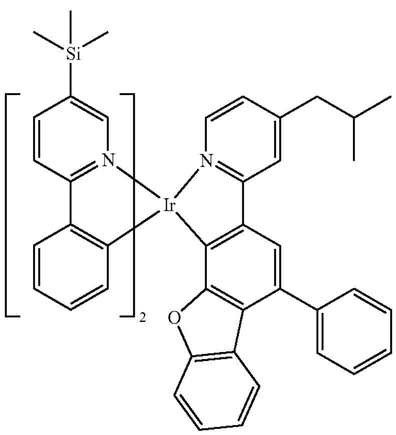
566
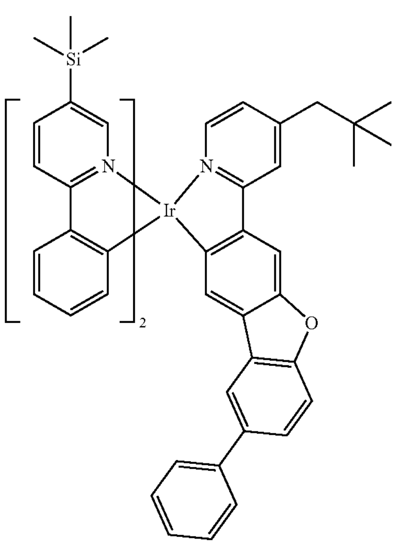
567
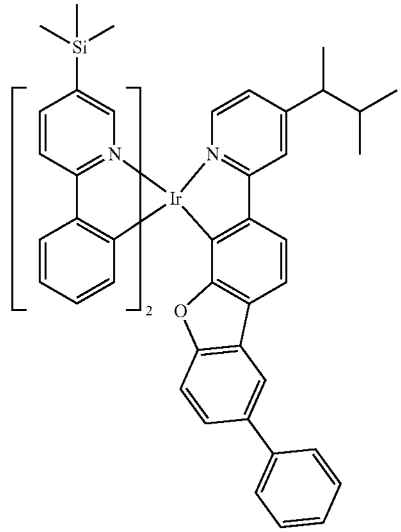
568
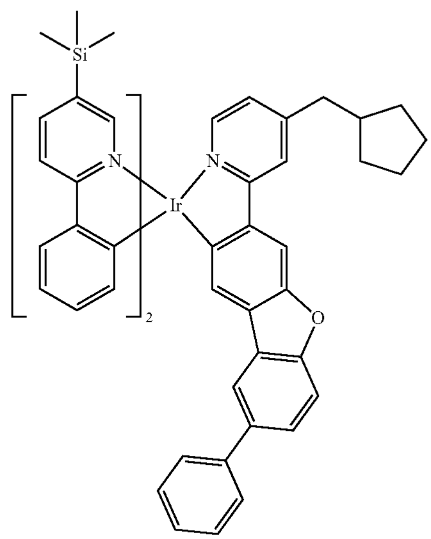
569
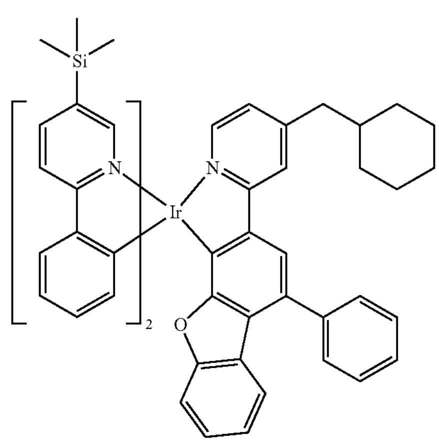

-continued
570
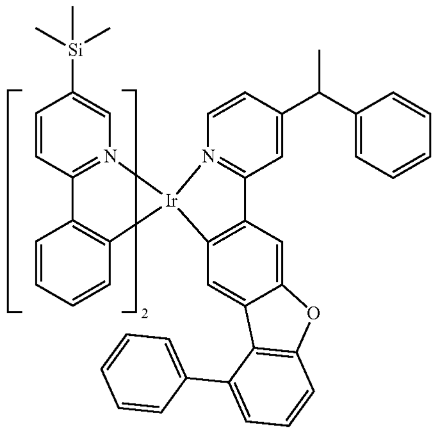
571
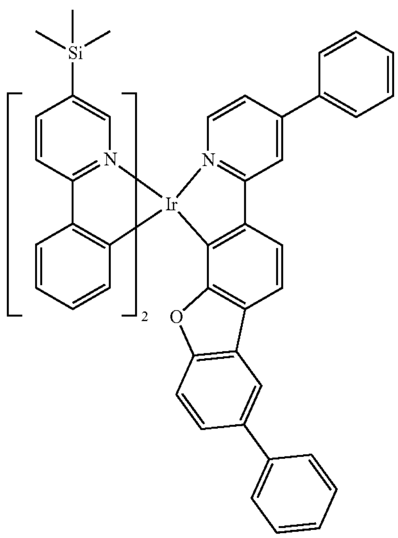
572
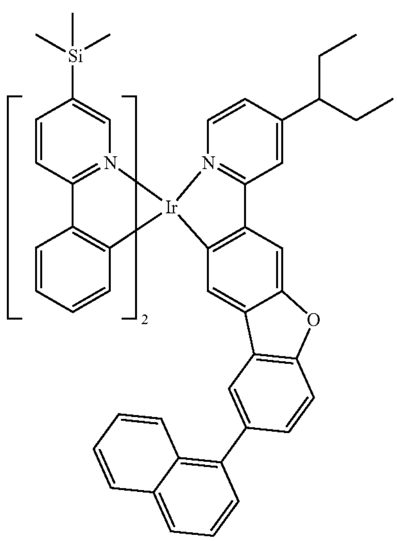
-continued
573
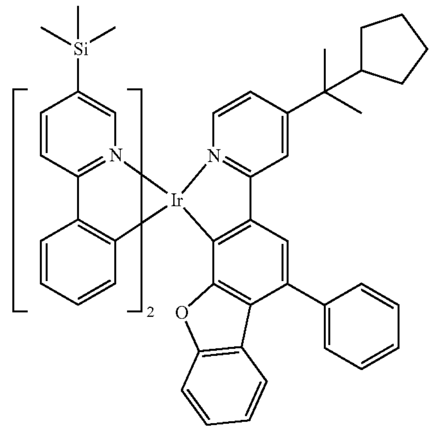
574
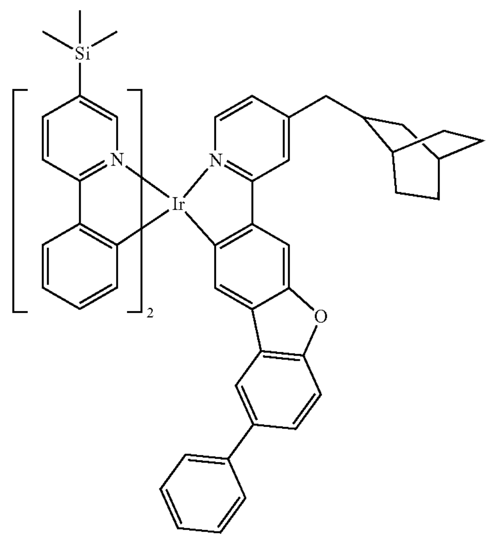
575
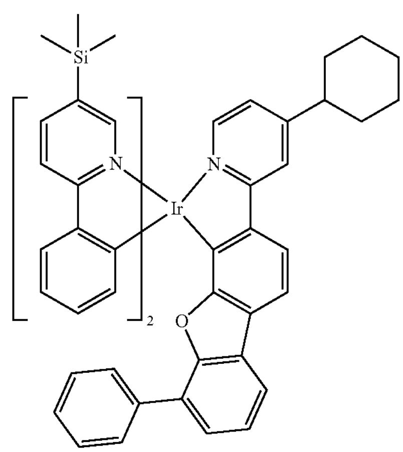

-continued
576
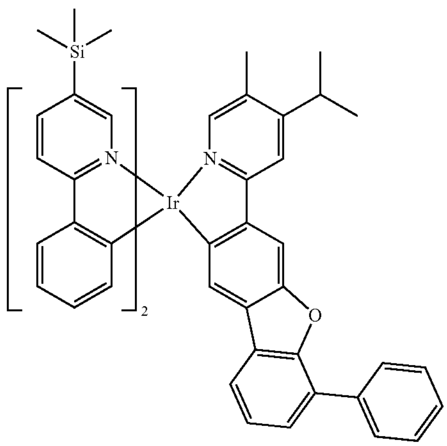
577
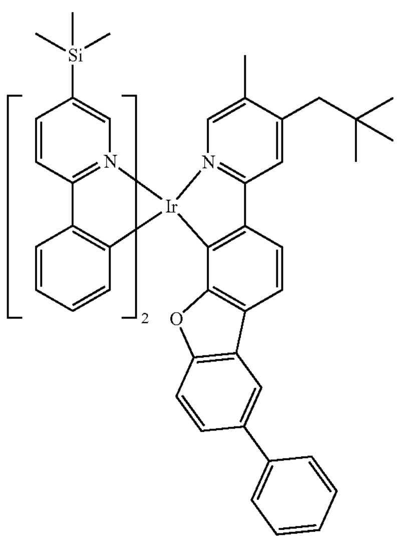
578
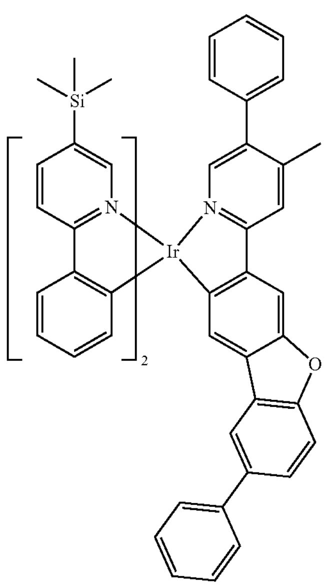
-continued
579
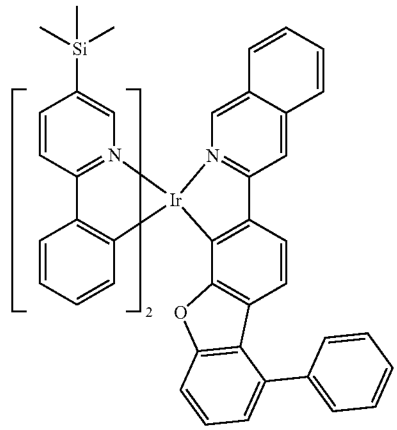
580
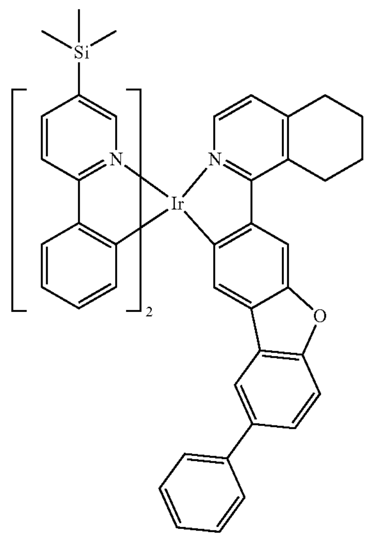
581
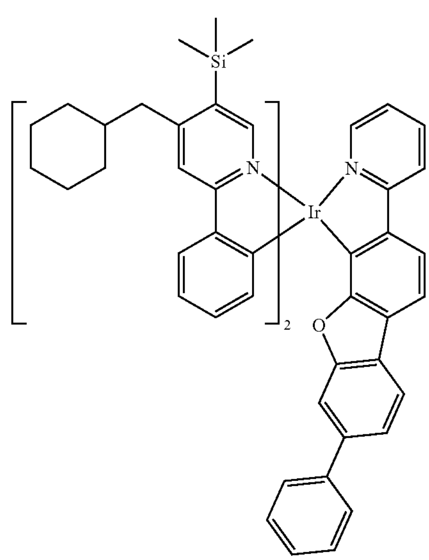

-continued
582
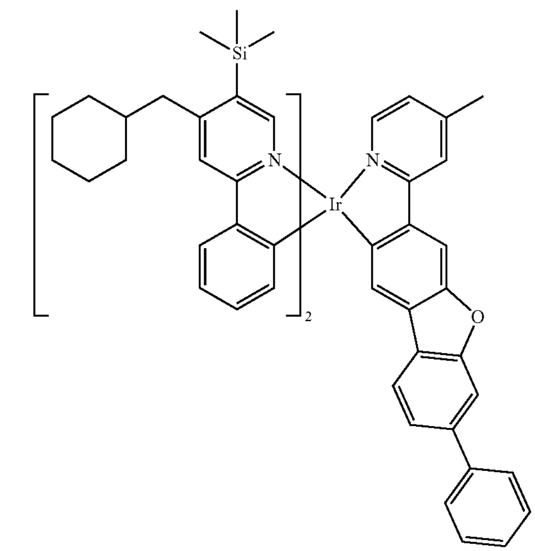
583
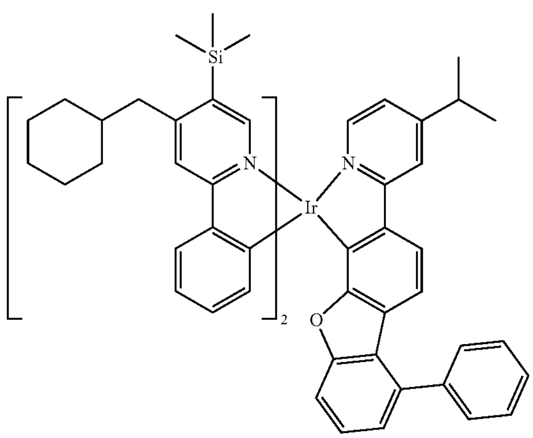
584
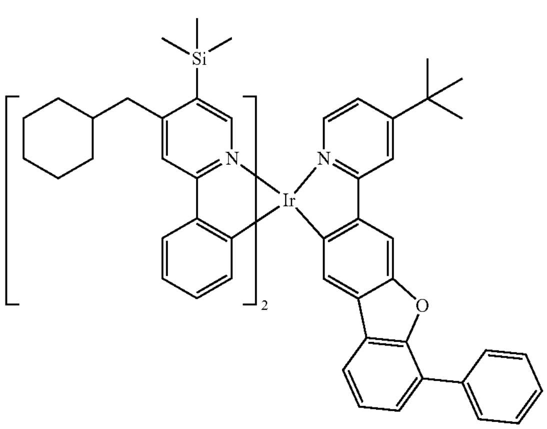
-continued
585
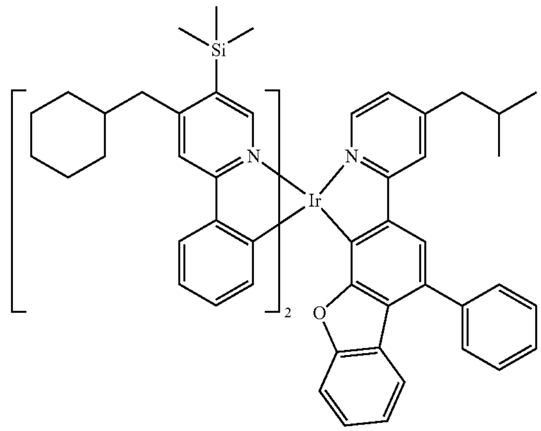
586
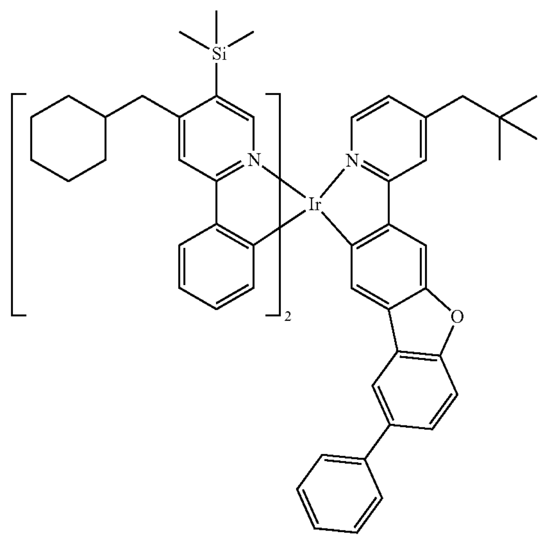
587
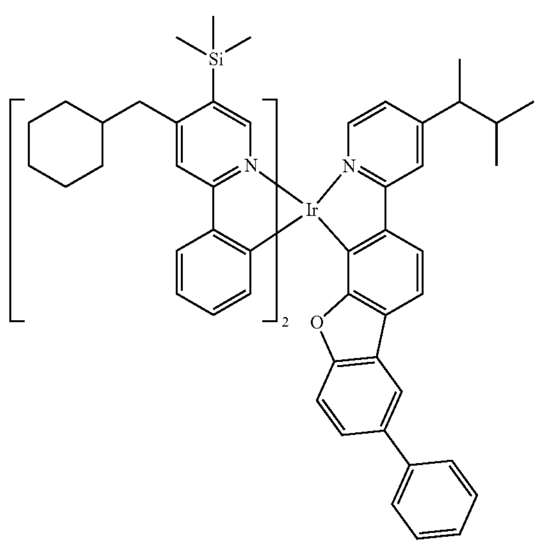

-continued
588
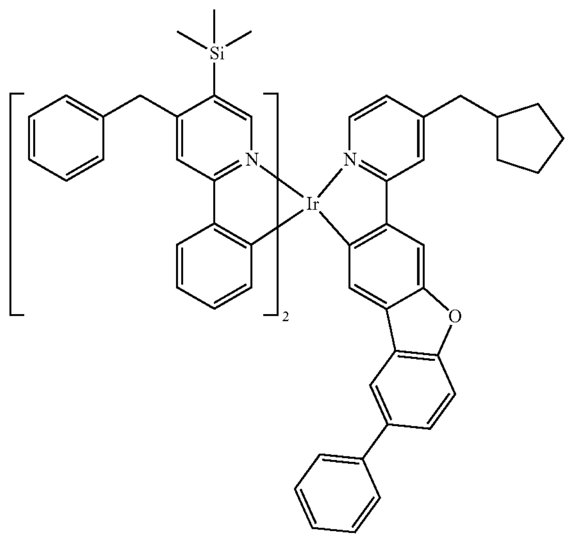
589
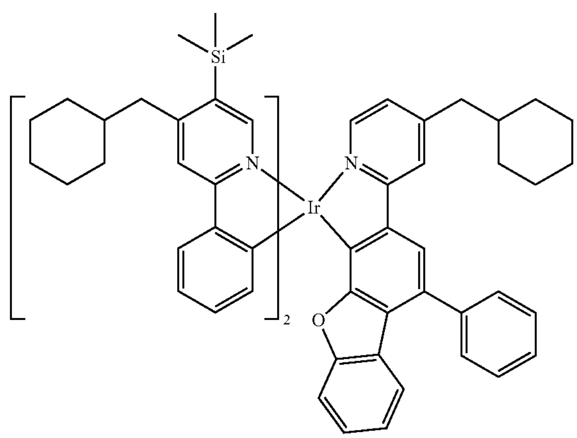
590
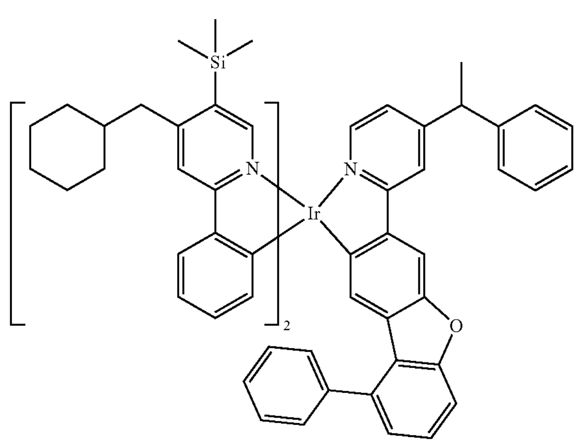
-continued
591
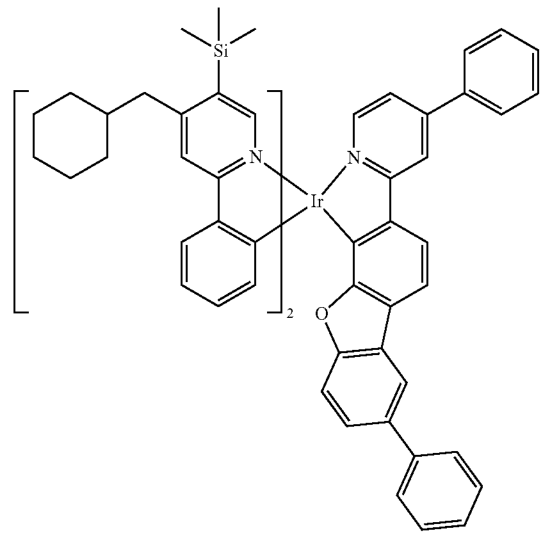
592
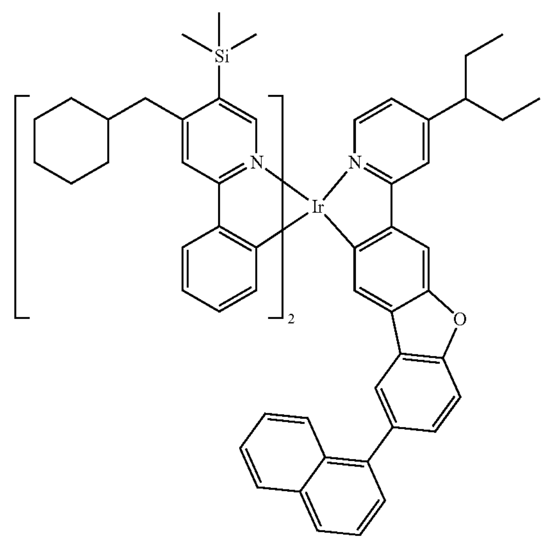
593
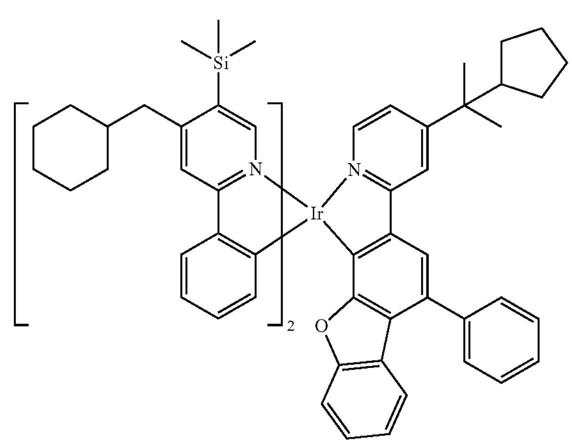

-continued
594
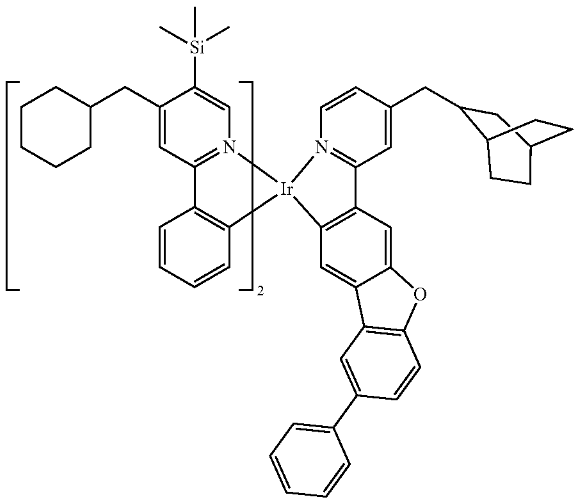
595
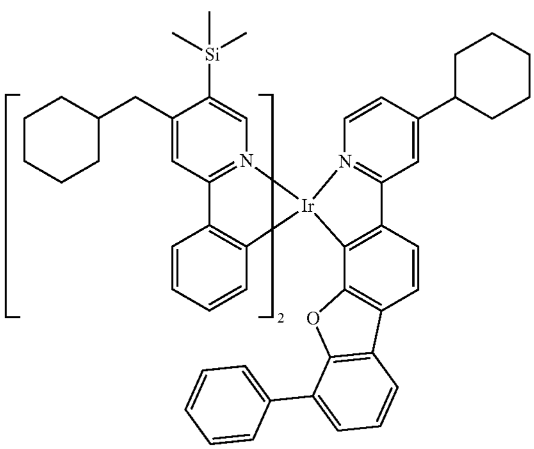
596
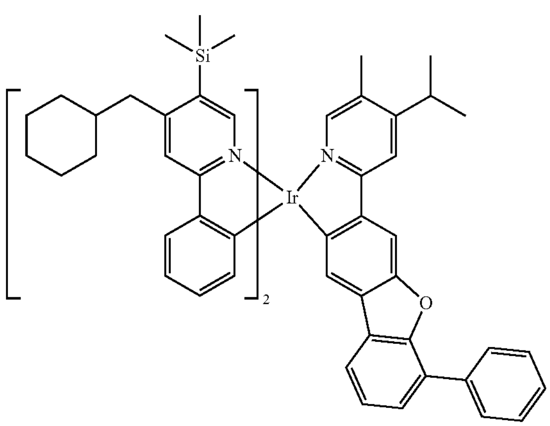
-continued
597
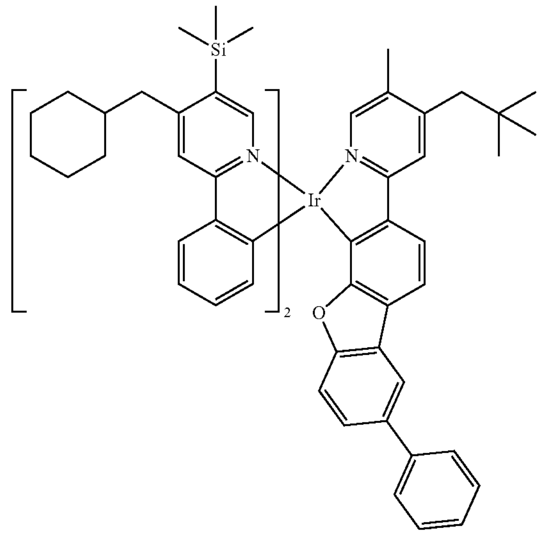
598
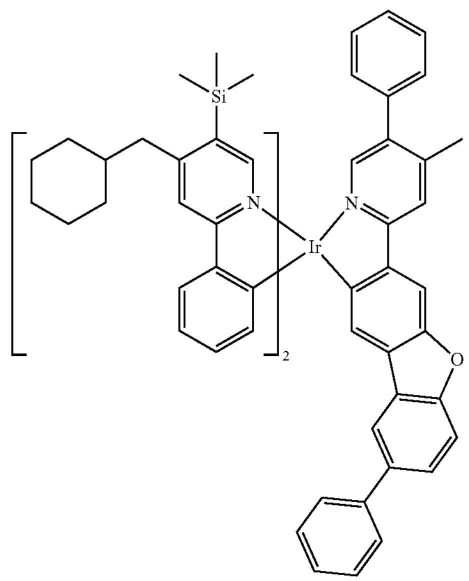
599
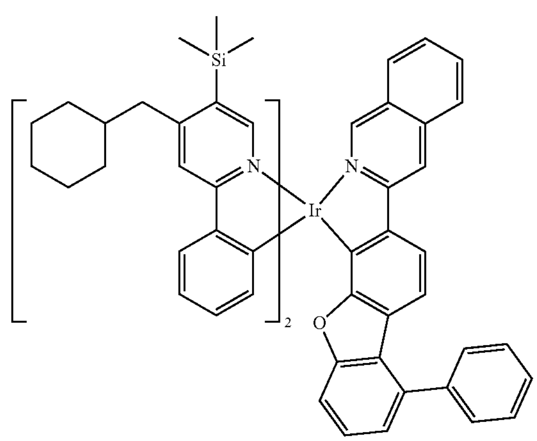

-continued
600
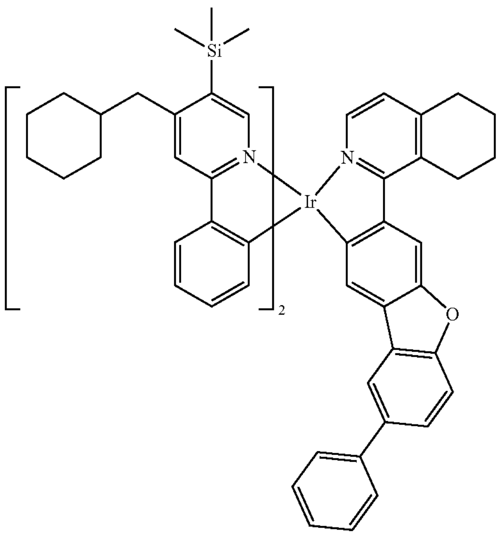
601
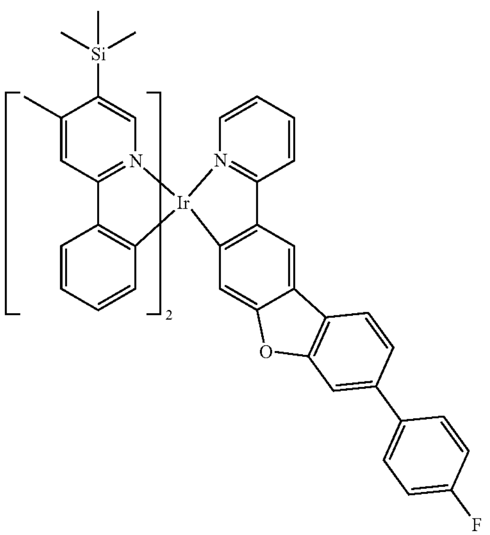
602
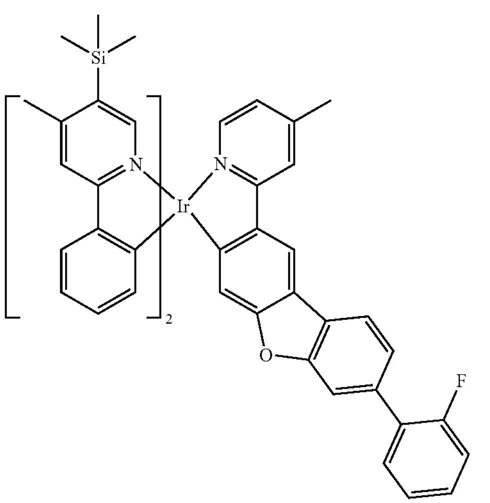
-continued
603
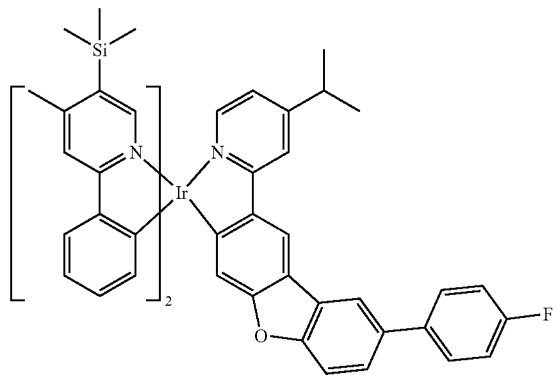
604
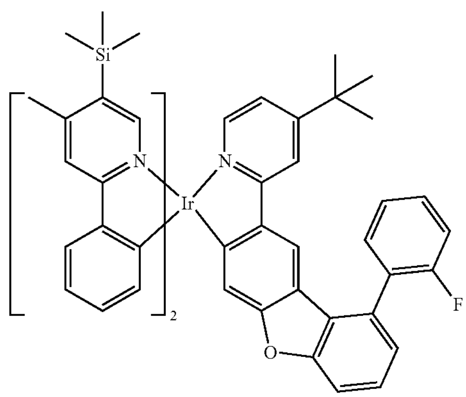
605
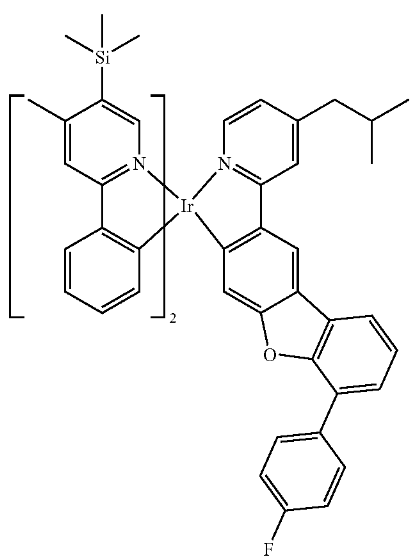

-continued
606
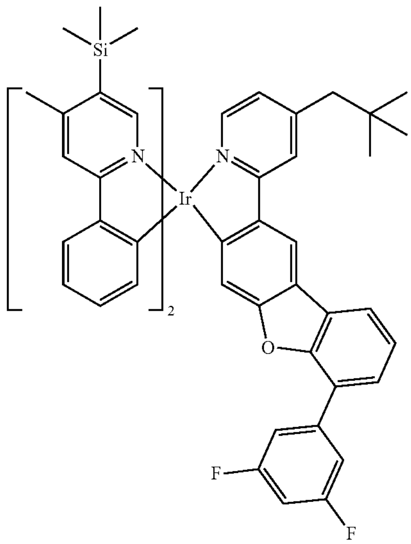
607
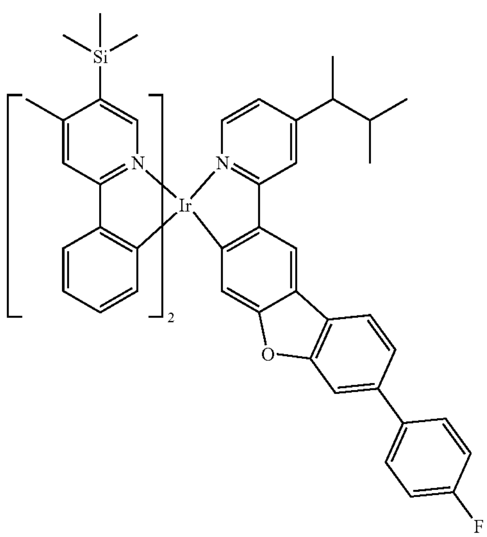
608
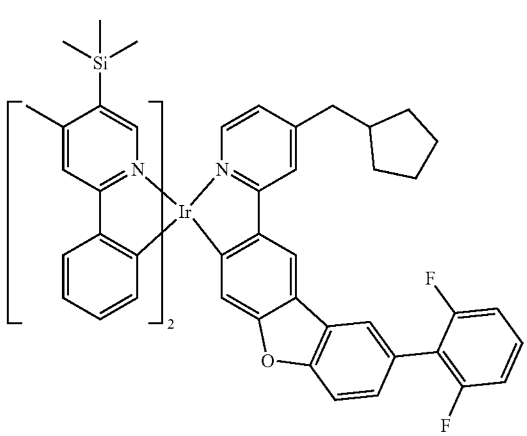
-continued
609
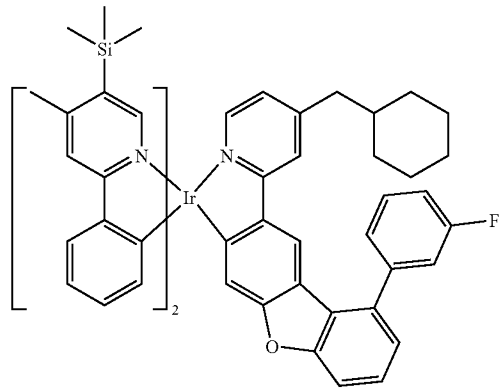
610
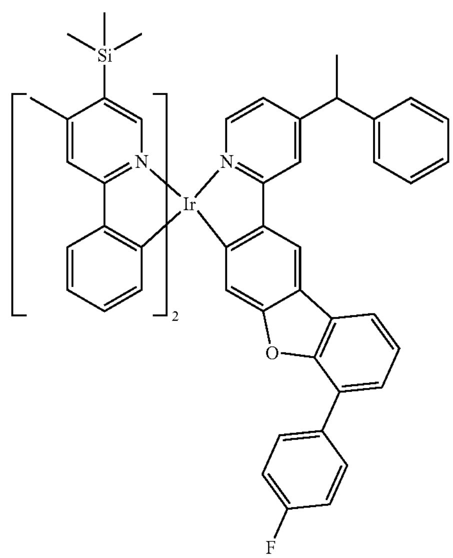
611
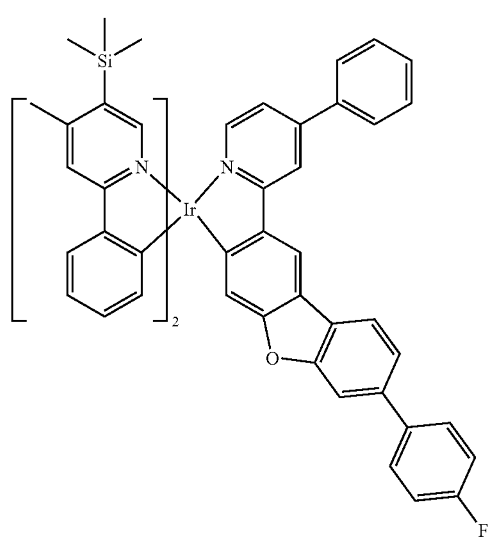

-continued
612
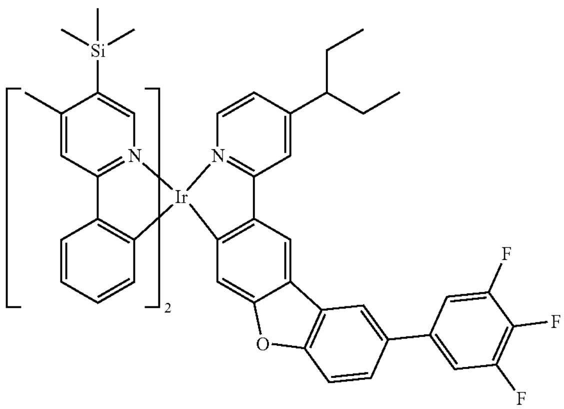
613
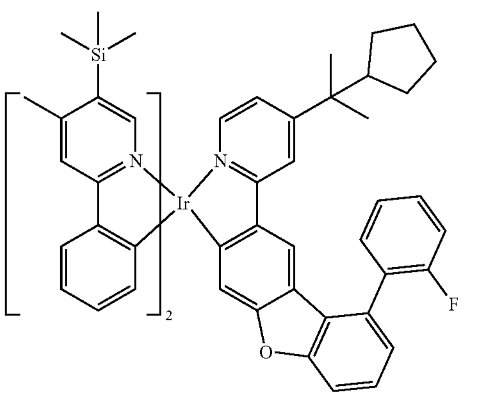
614
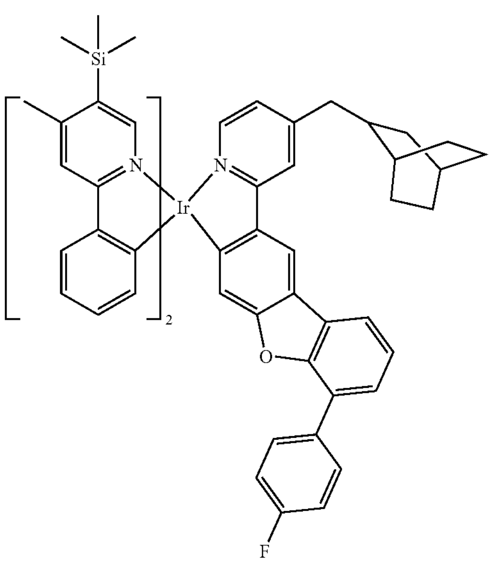
-continued
615
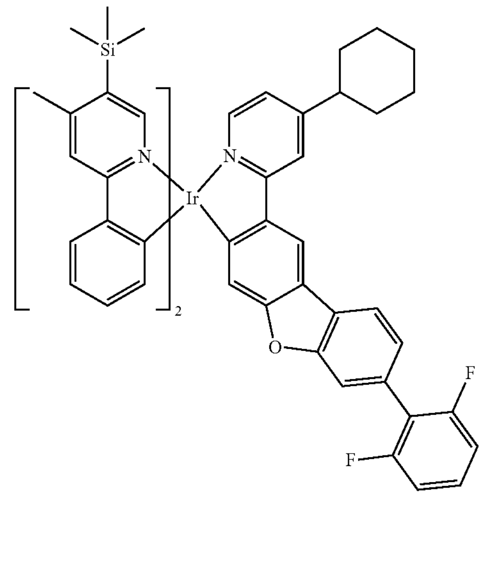
616
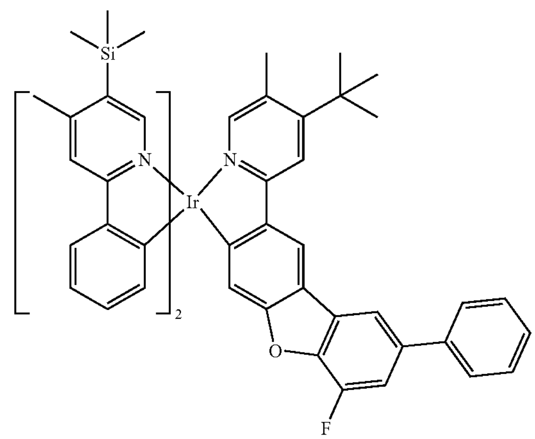
617
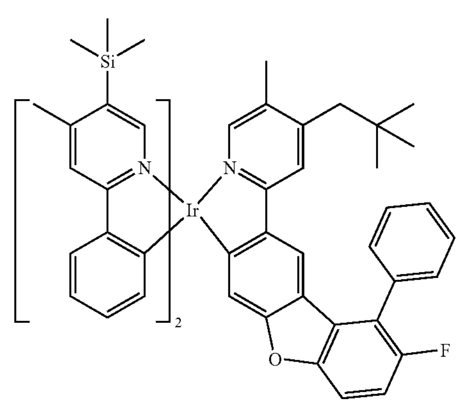

-continued
618
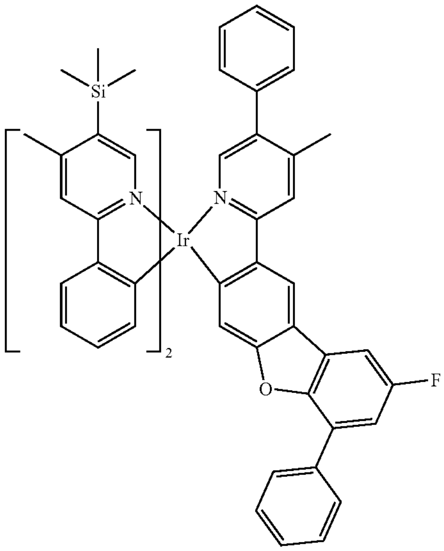
619
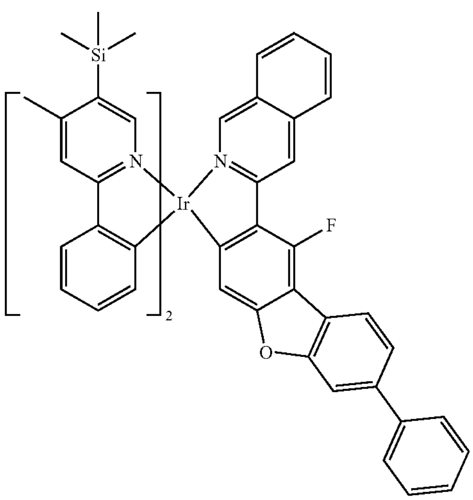
620
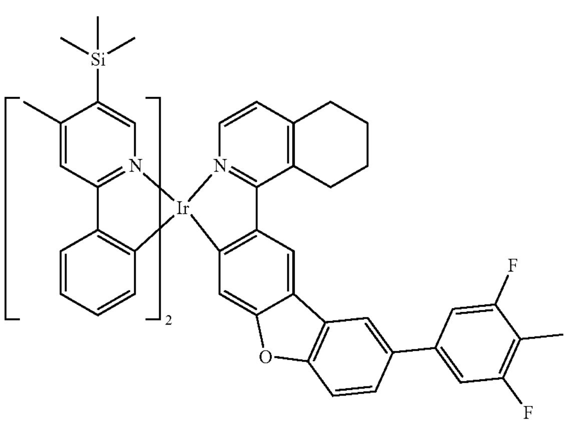
-continued
621
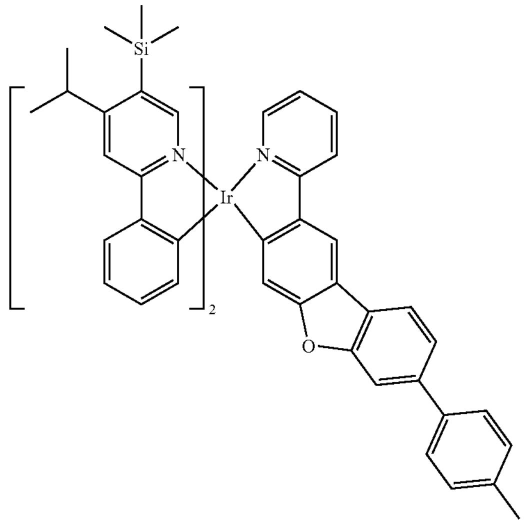
622
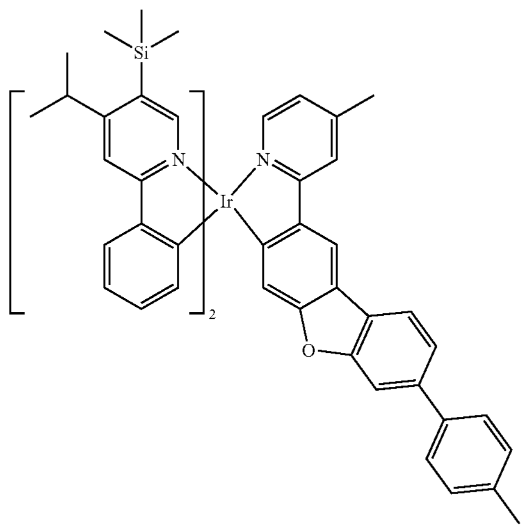
623
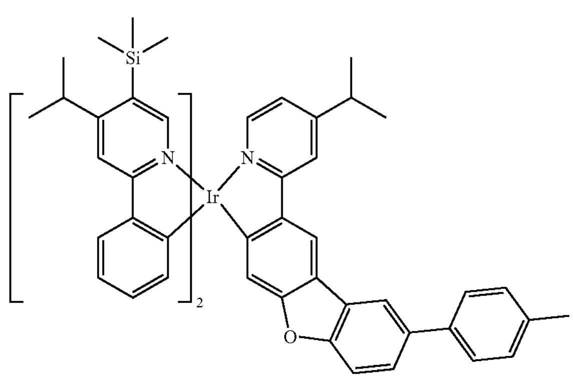

-continued
624
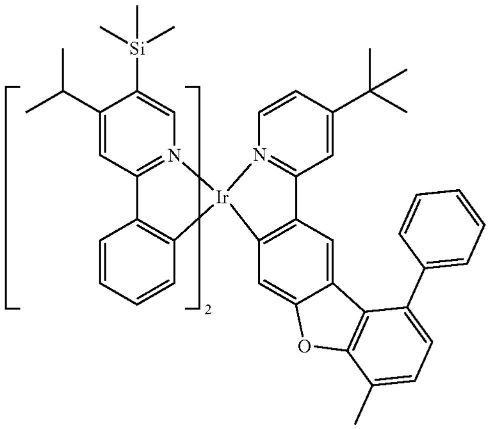
625
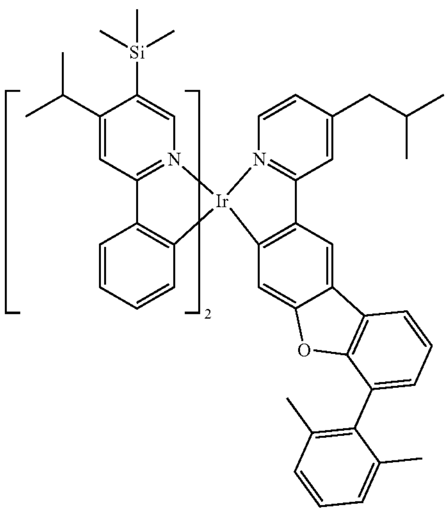
626
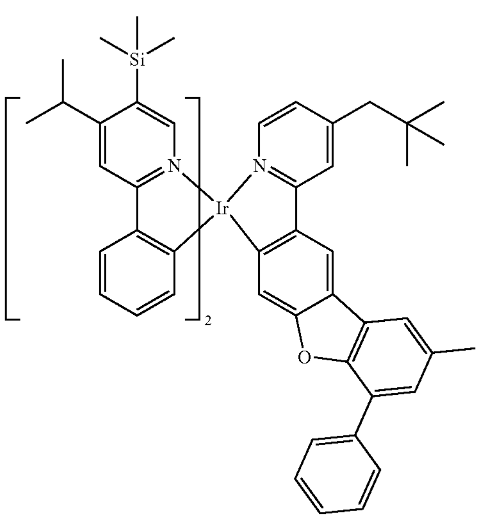
-continued
627
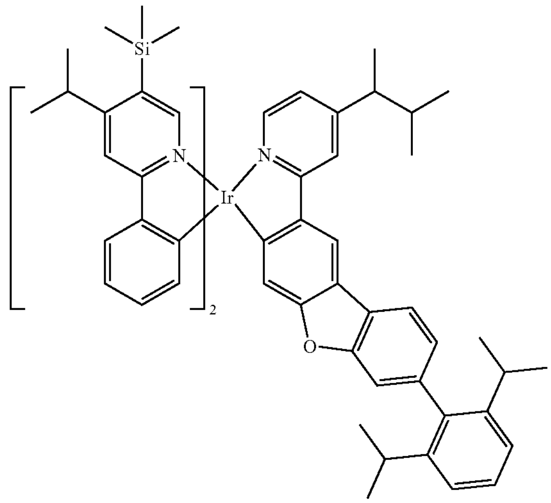
628
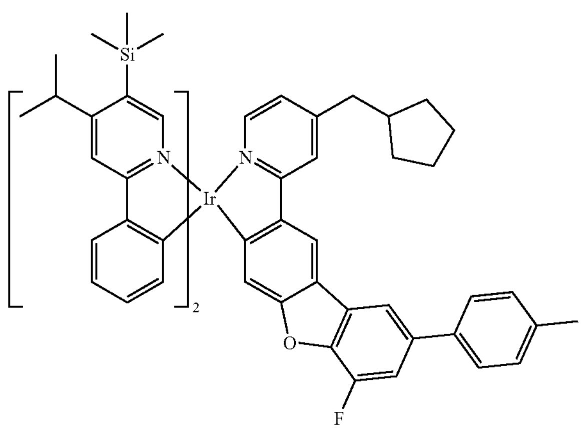
629
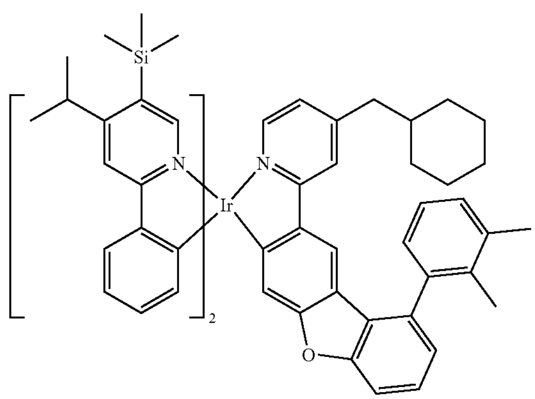

-continued
630
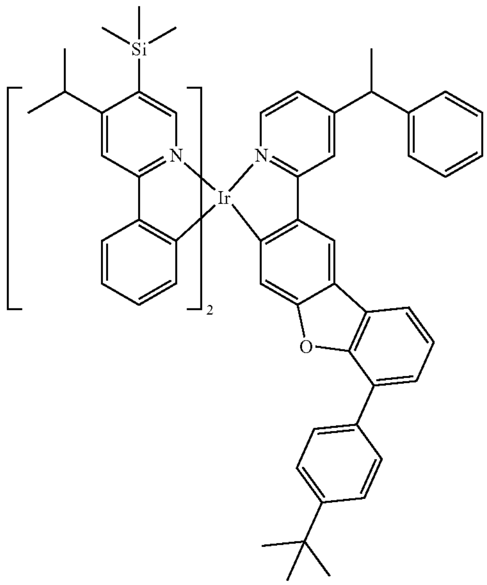
631
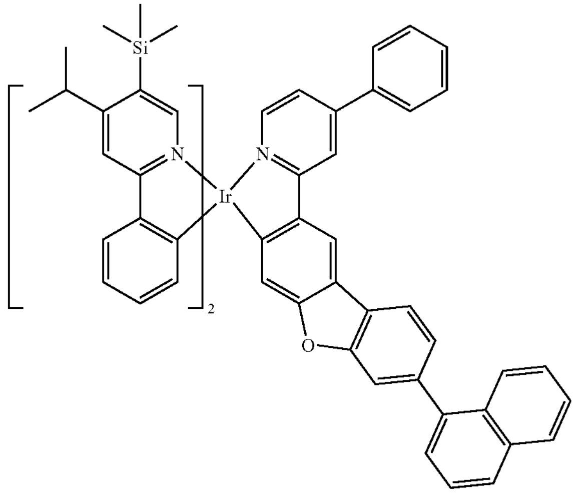
632
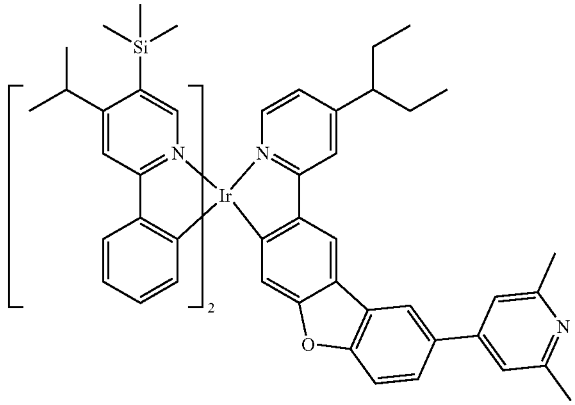
-continued
633
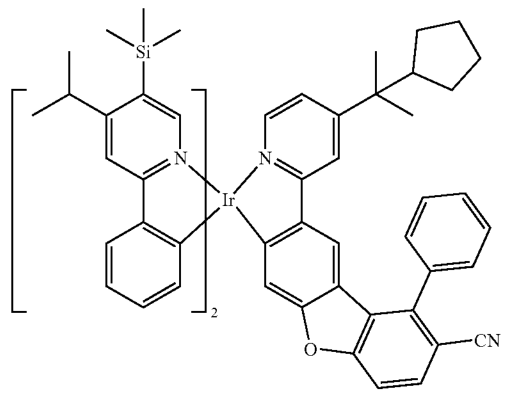
634
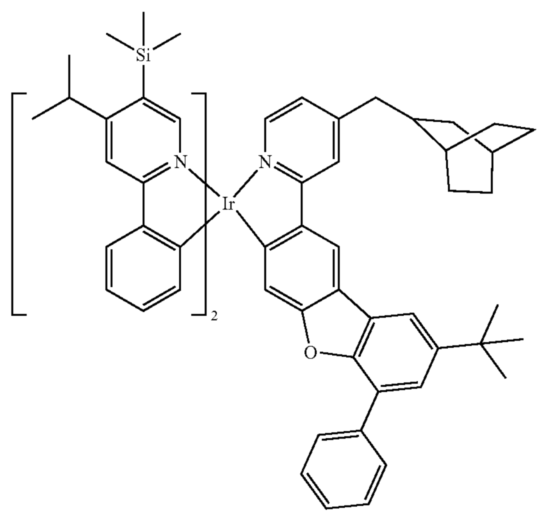
635
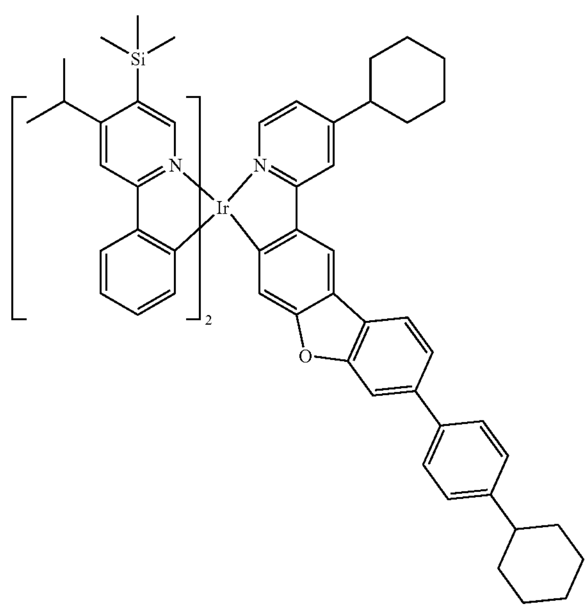

-continued
636
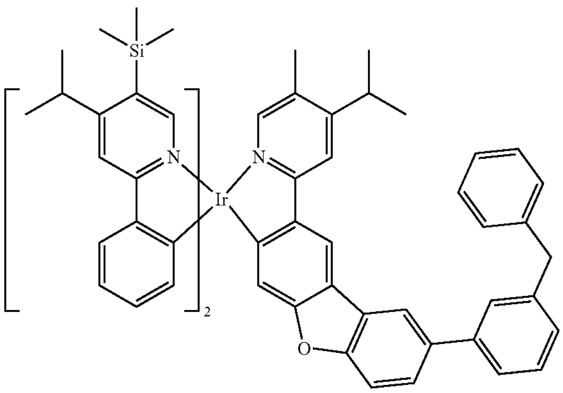
637
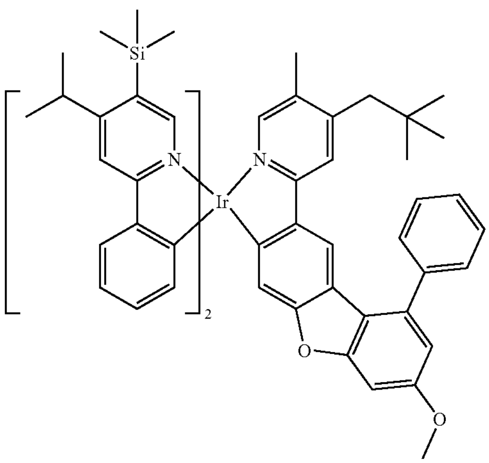
638
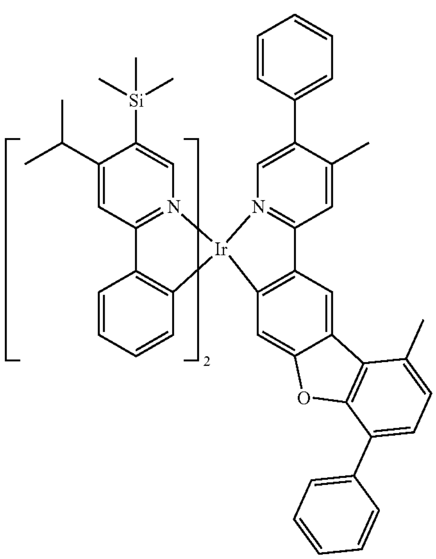
-continued
639
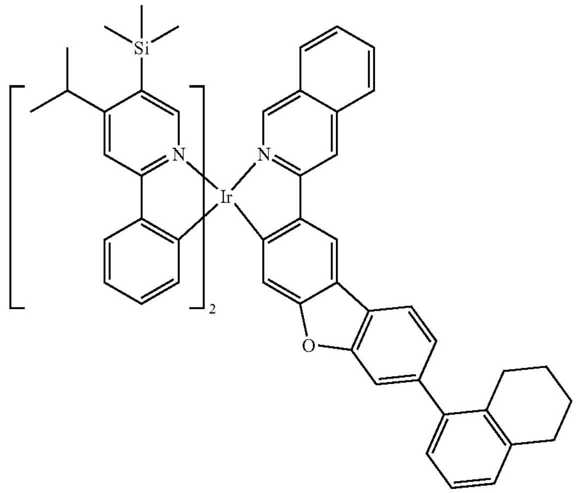
640
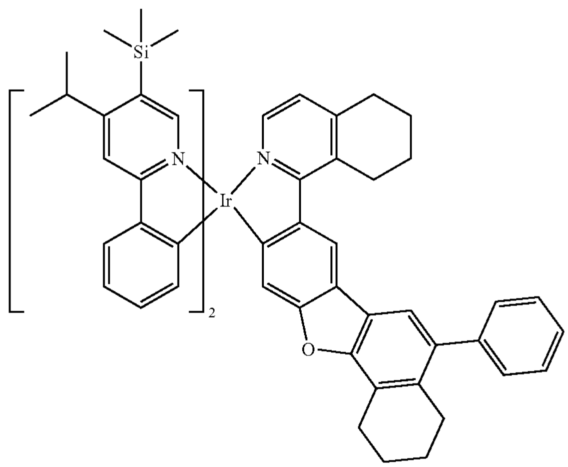
641
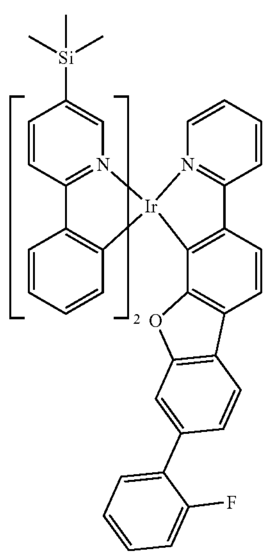

-continued
642
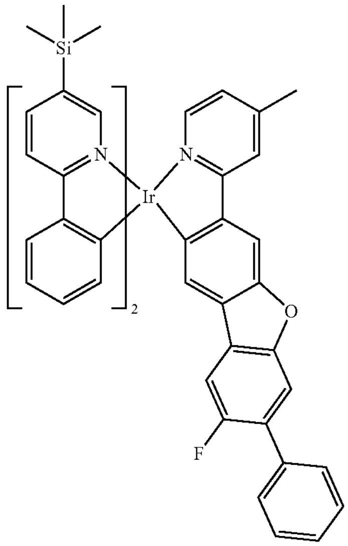
643
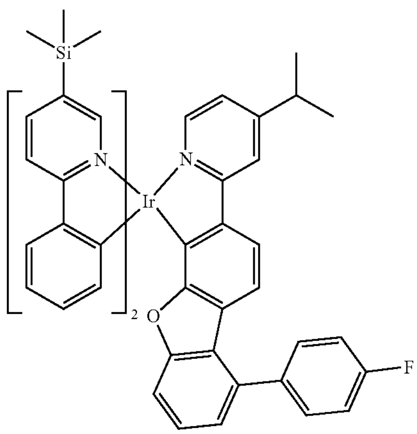
644
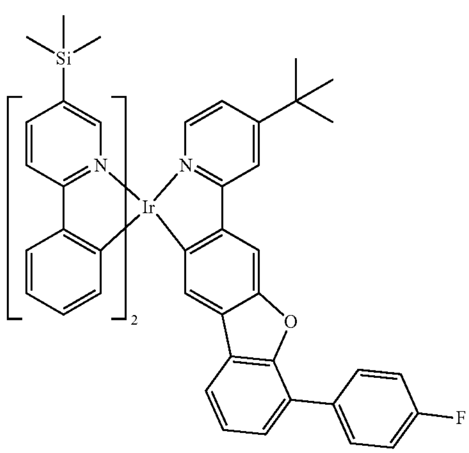
-continued
645
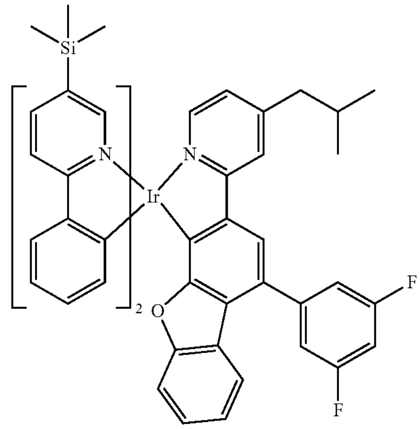
646
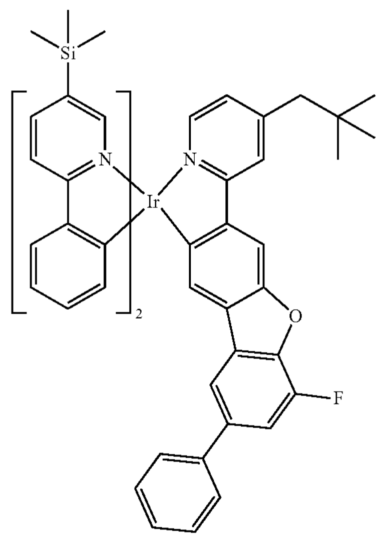
647
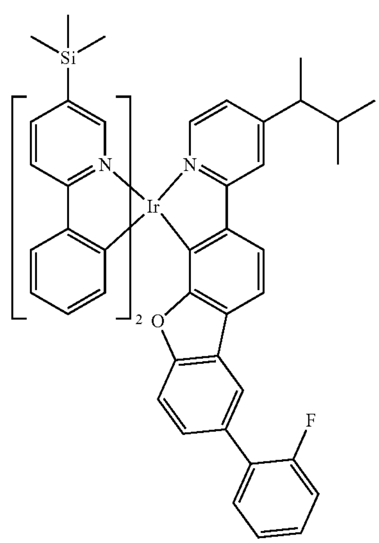

648
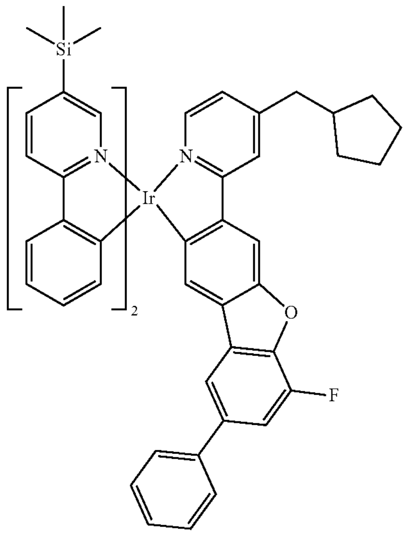
649
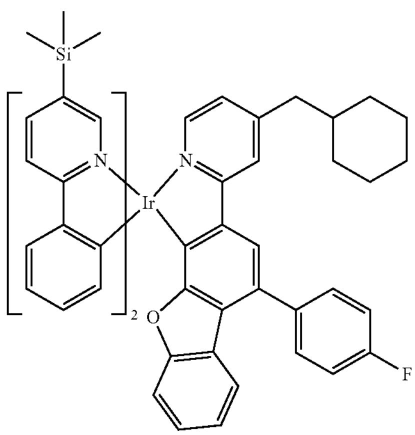
650
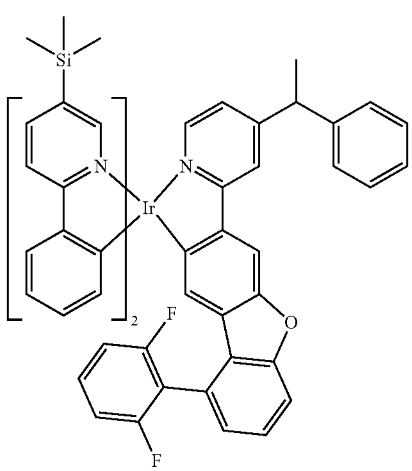
651
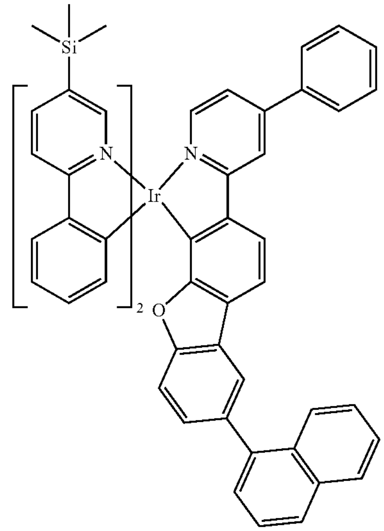
652
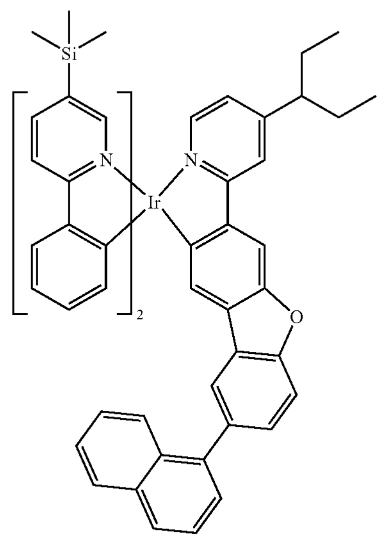
653
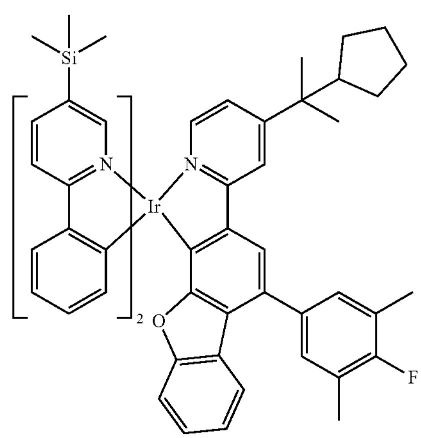

654
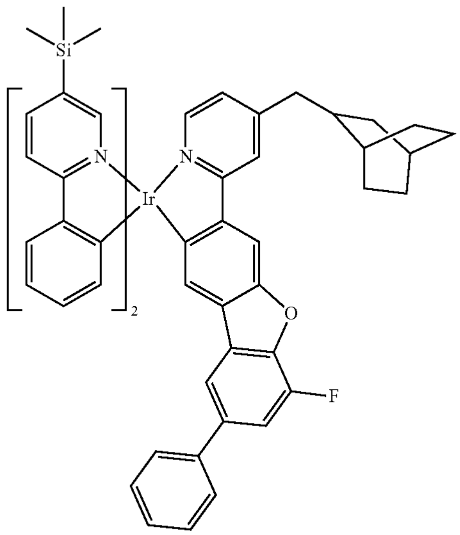
655
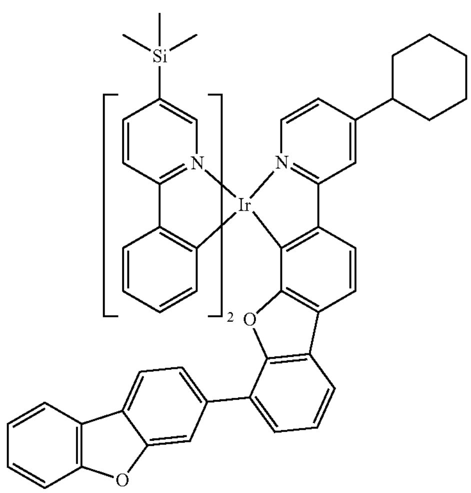
656
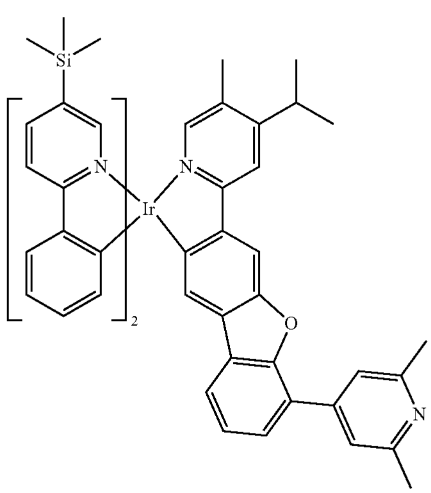
657
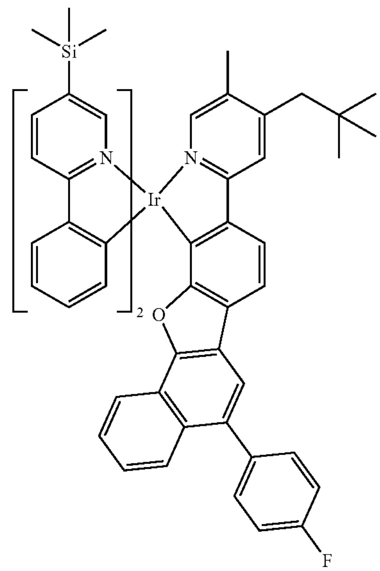
658
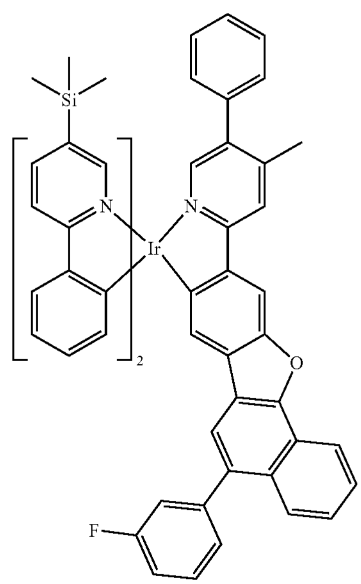
659
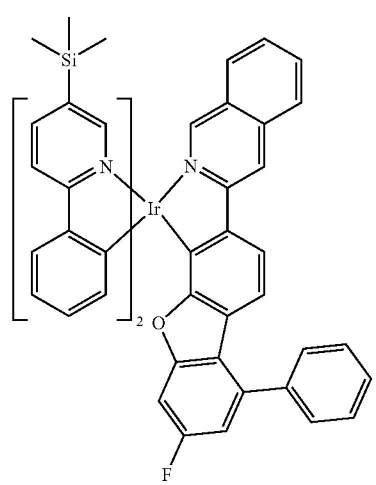

-continued
660
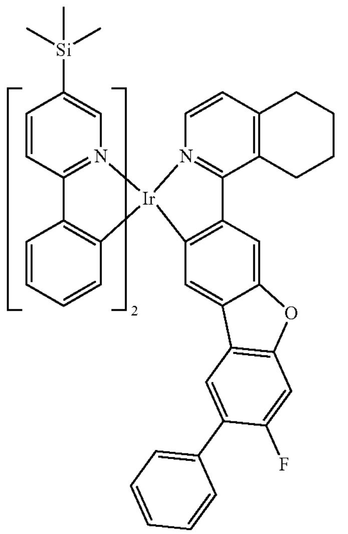
661
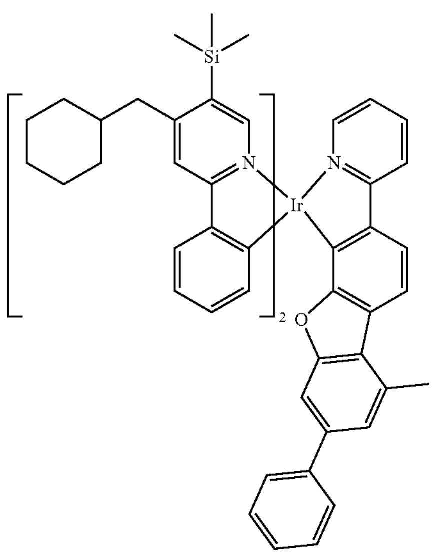
662
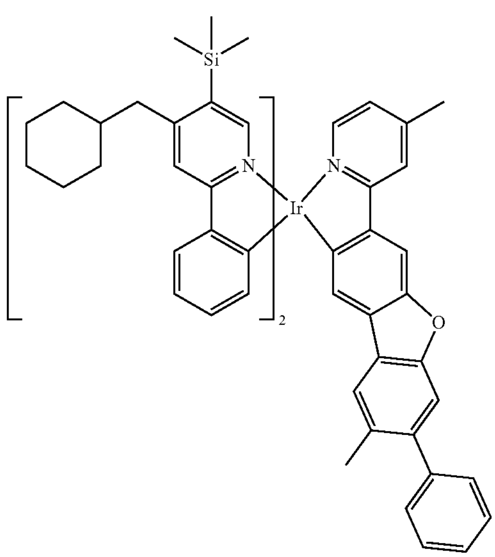
-continued
663
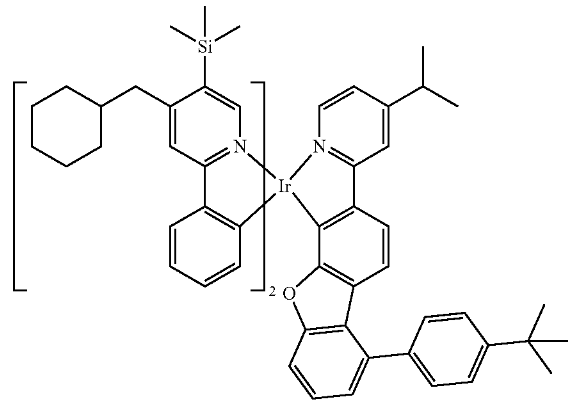
664
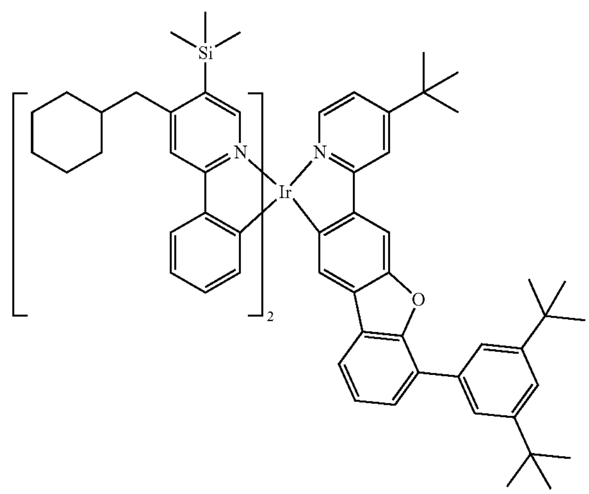
665
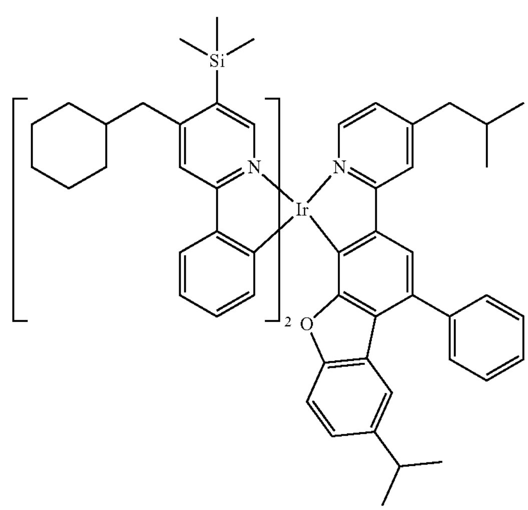

-continued
666
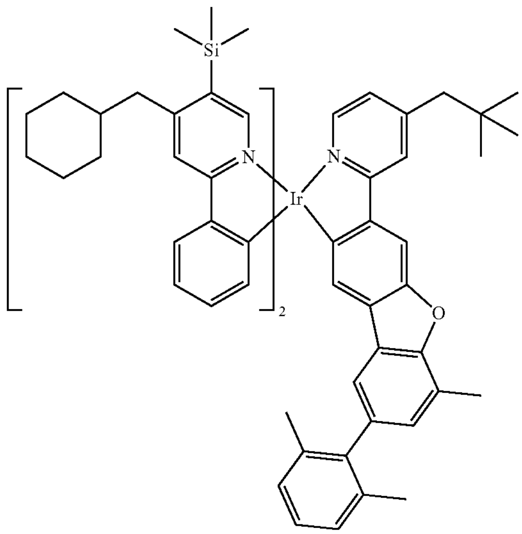
667
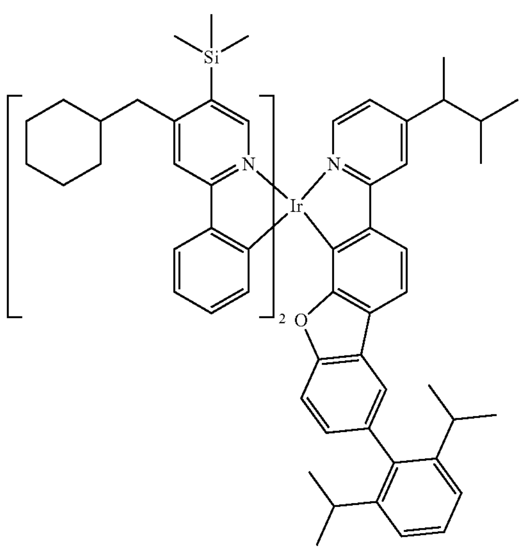
-continued
668
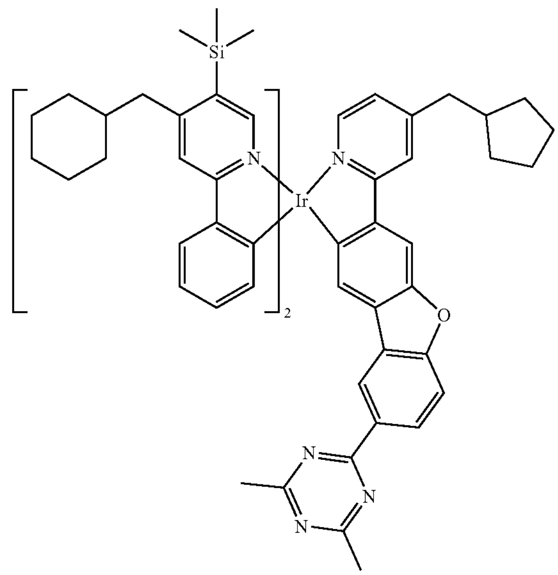
669
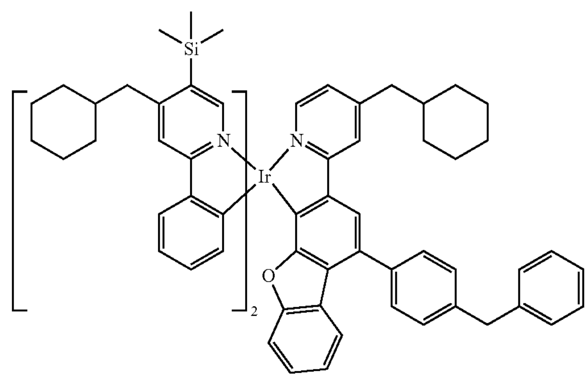
670
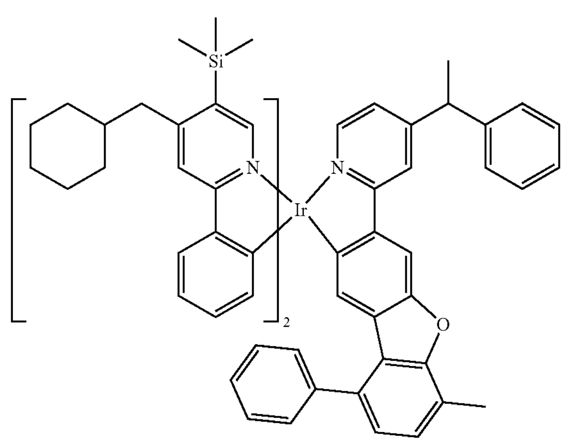

671
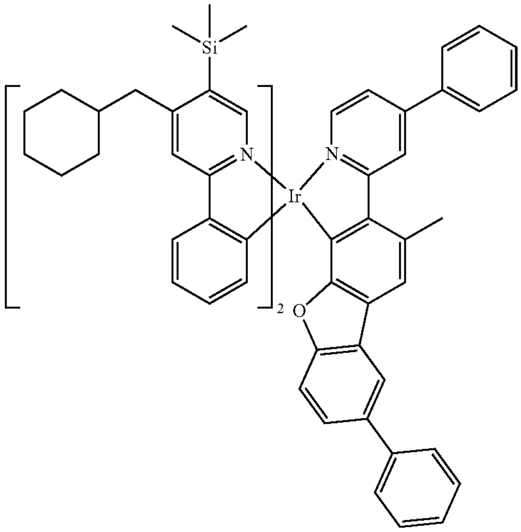
672
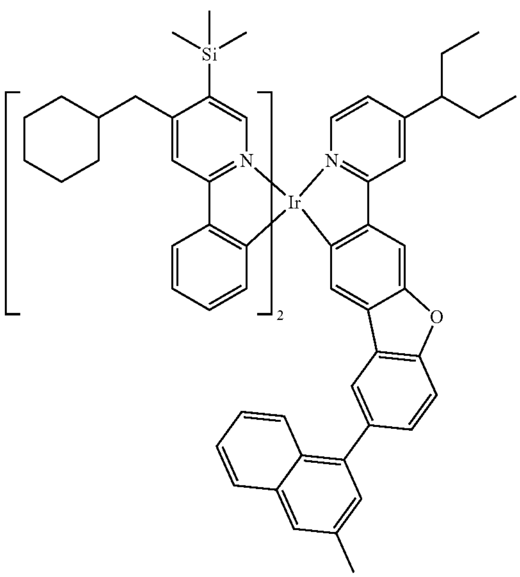
673
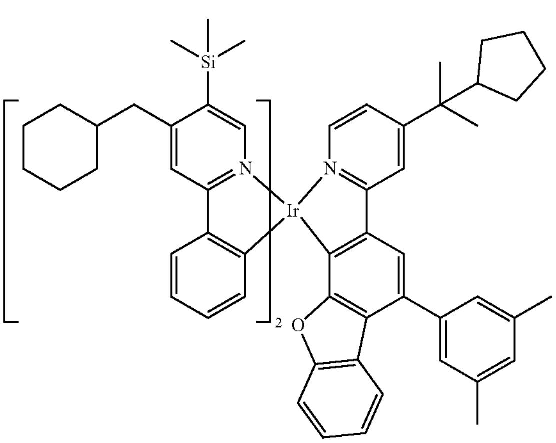
674
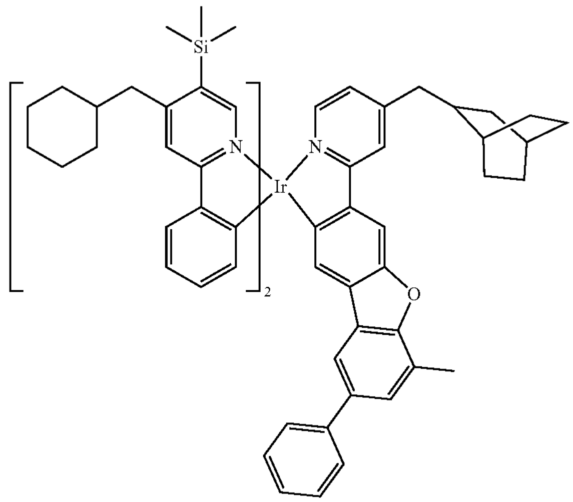
675
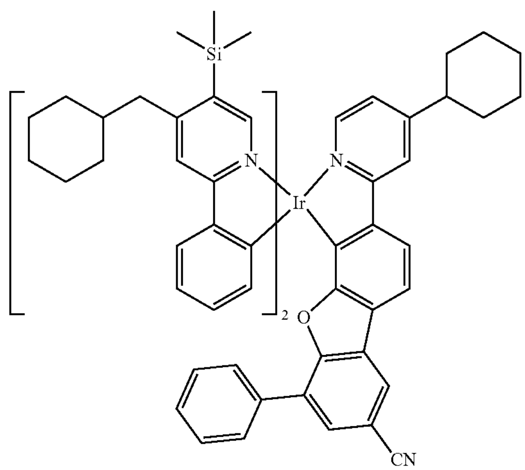
676
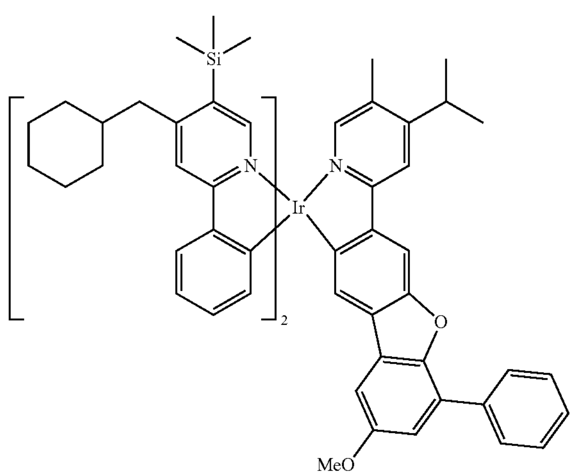

677
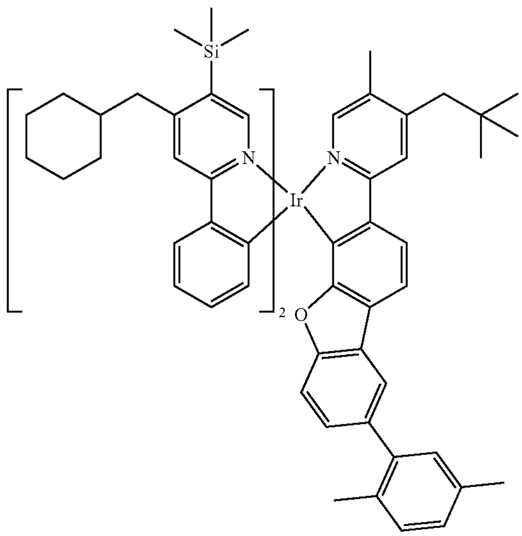
678
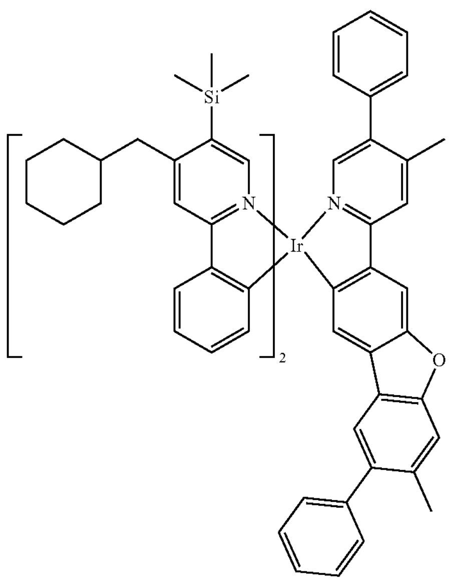
679
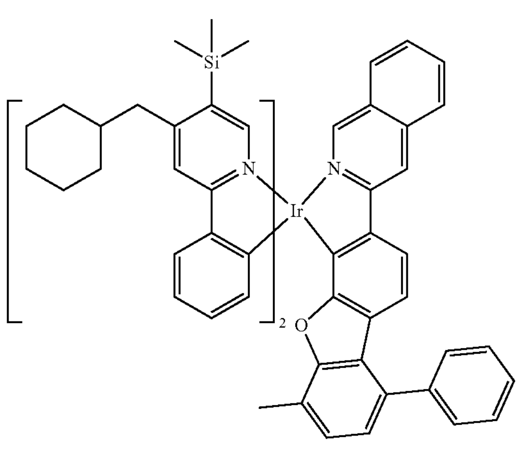
680
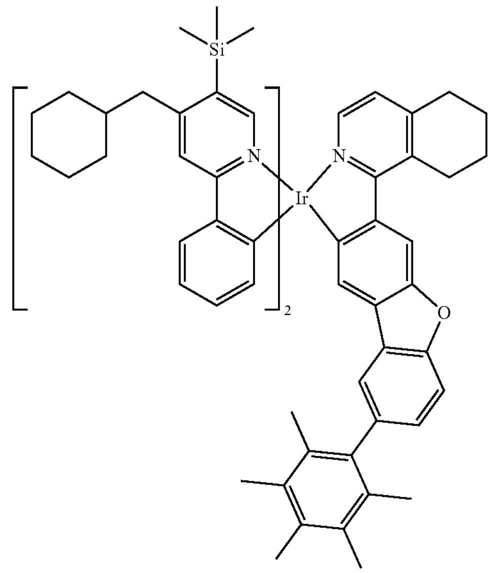
681
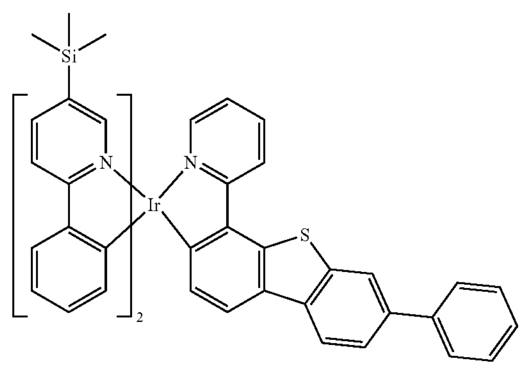
682
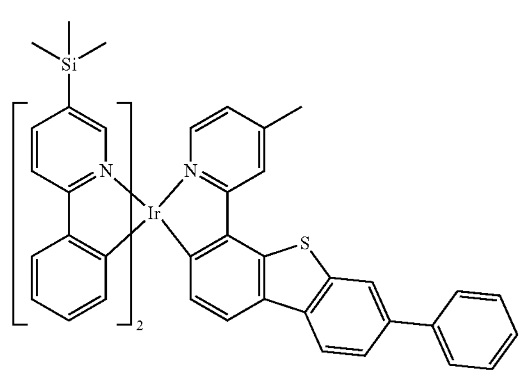

-continued
683
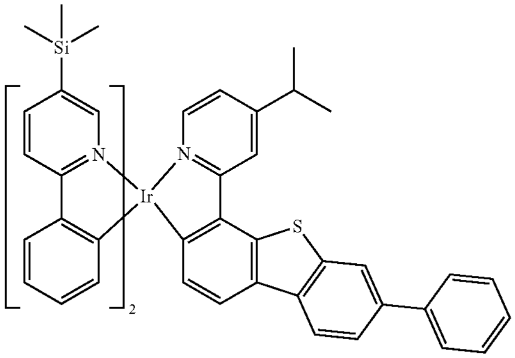
684
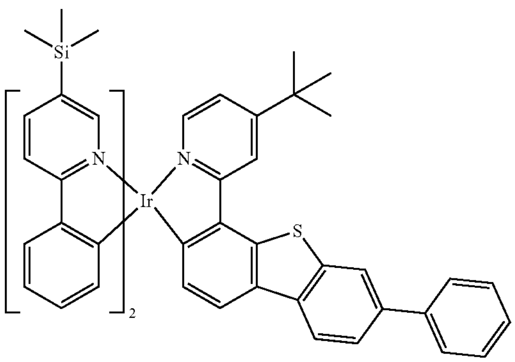
685
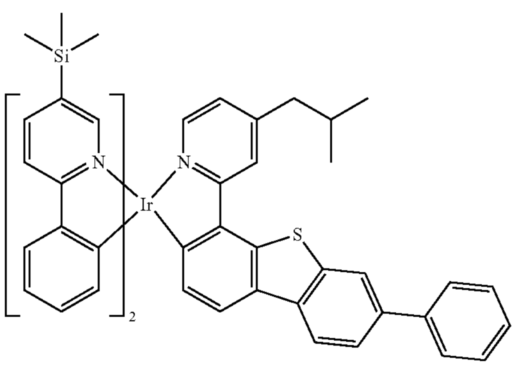
686
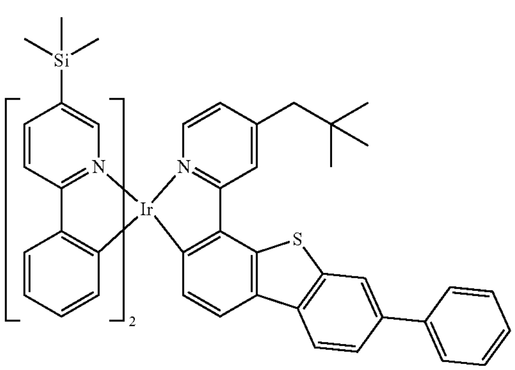
-continued
687
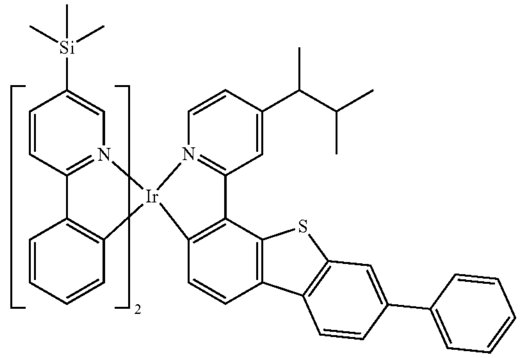
688
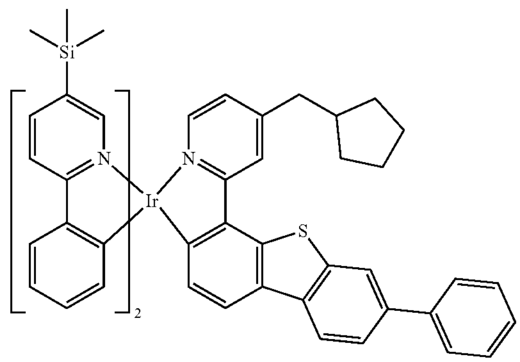
689
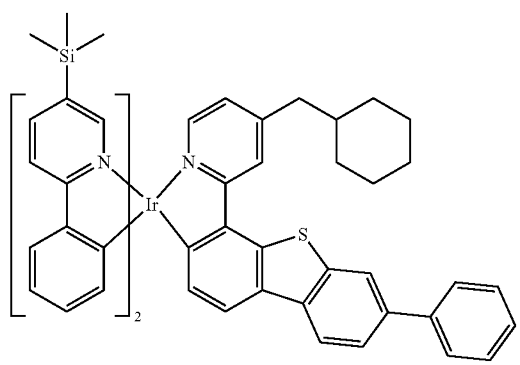
690
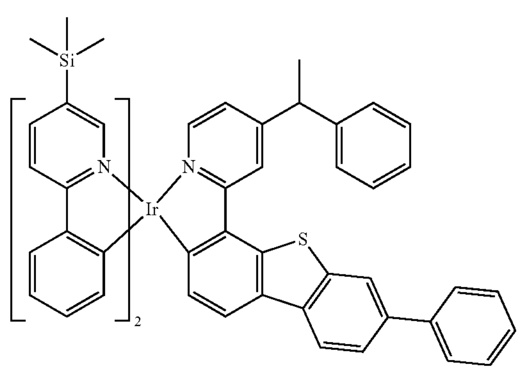

-continued
691
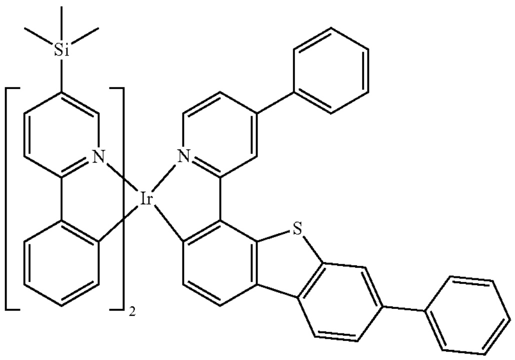
692
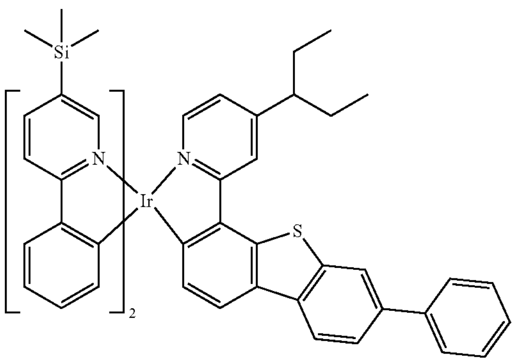
693
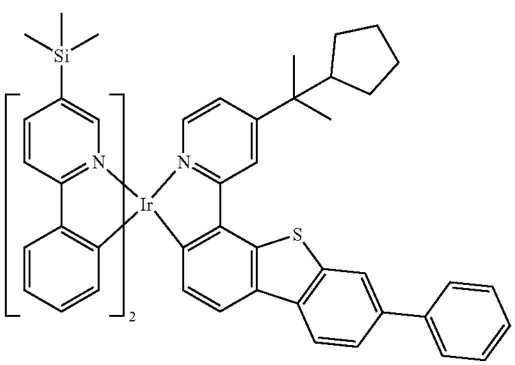
694
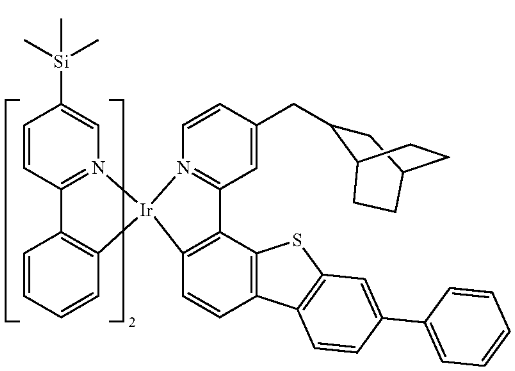
-continued
695
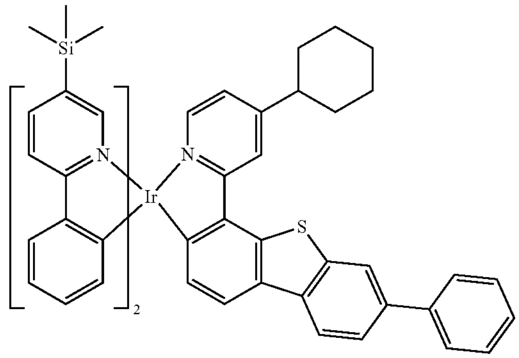
696
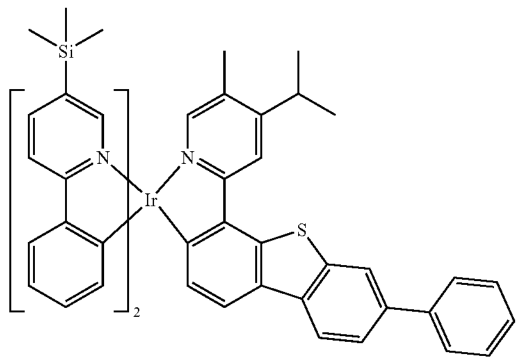
697
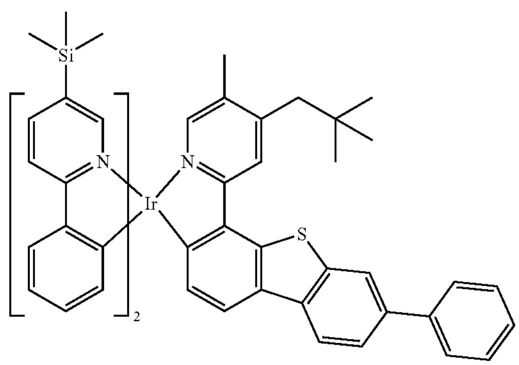
698
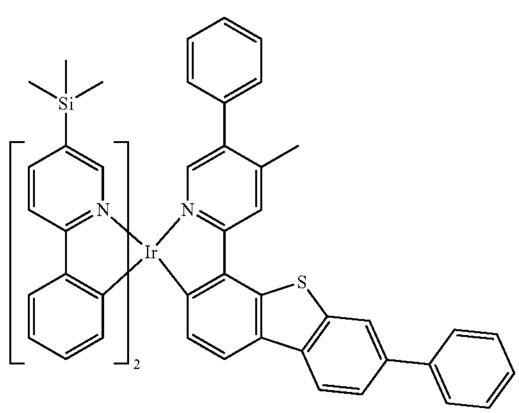

-continued
699
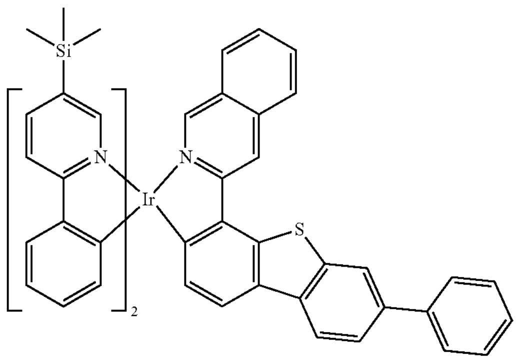
700
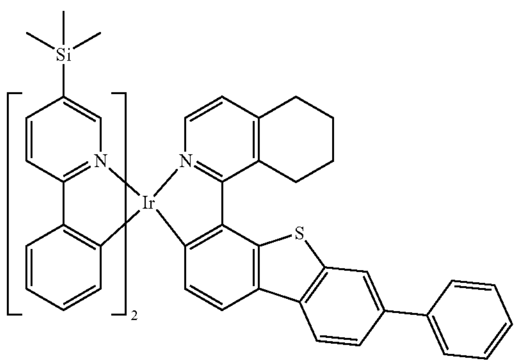
701
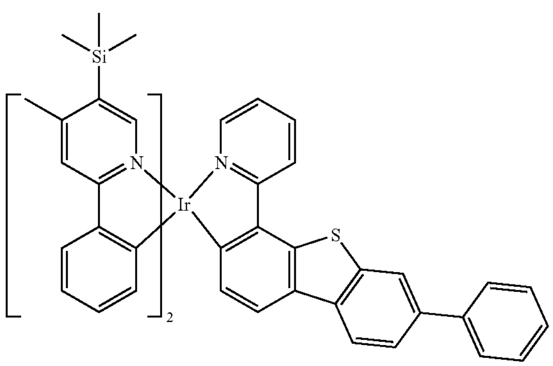
702
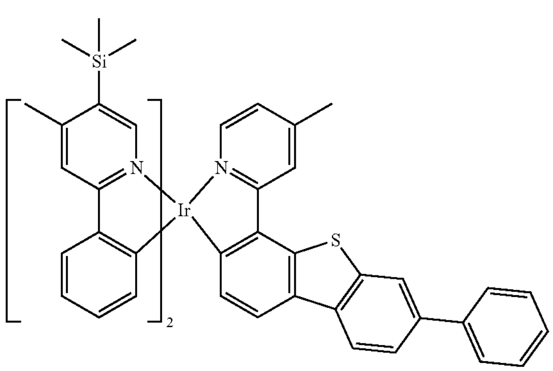
-continued
703
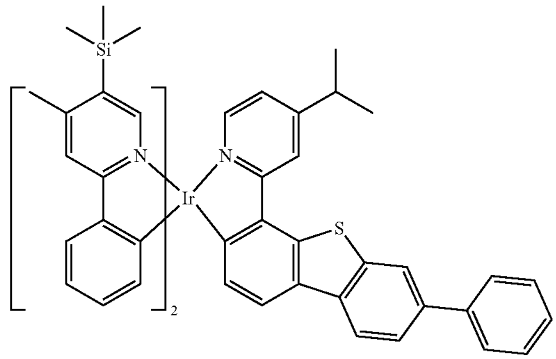
704
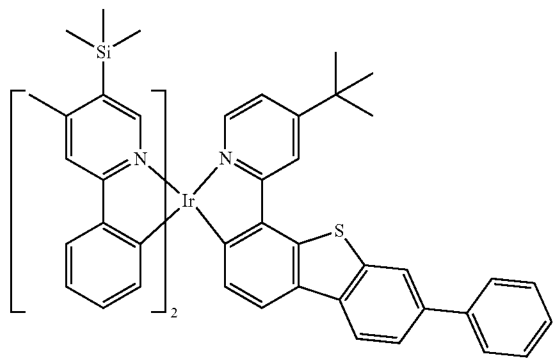
705
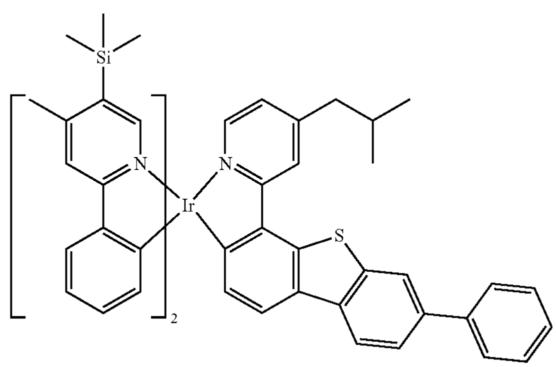
706
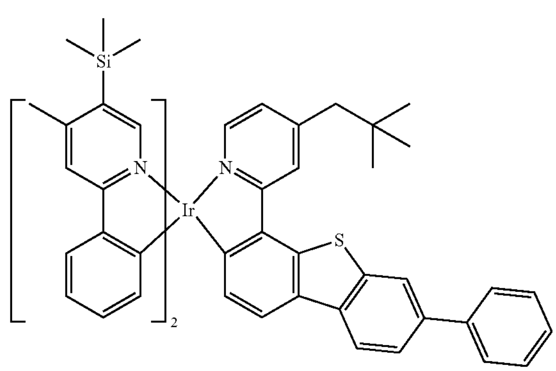

-continued
707
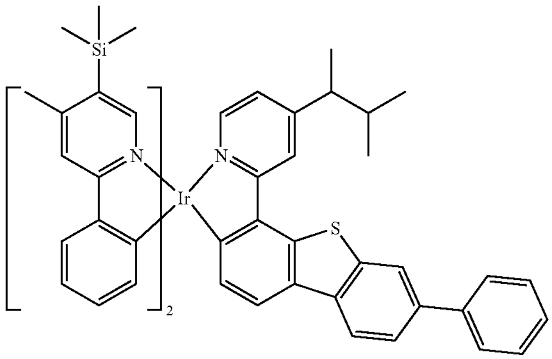
708
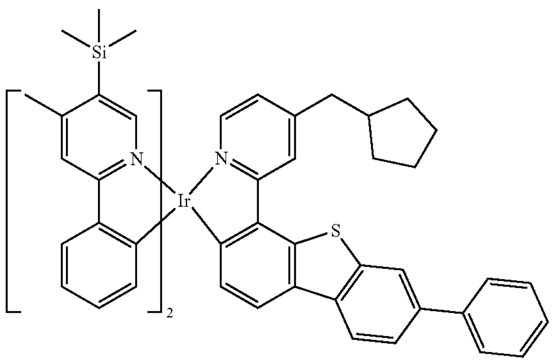
709
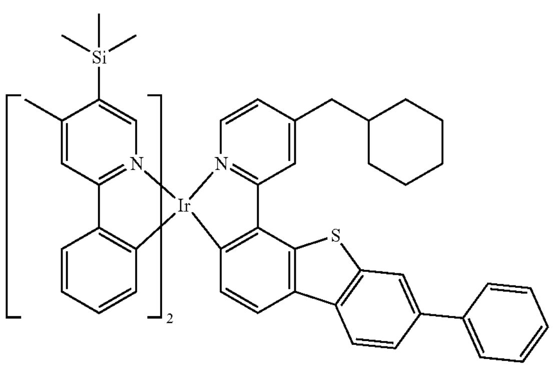
710
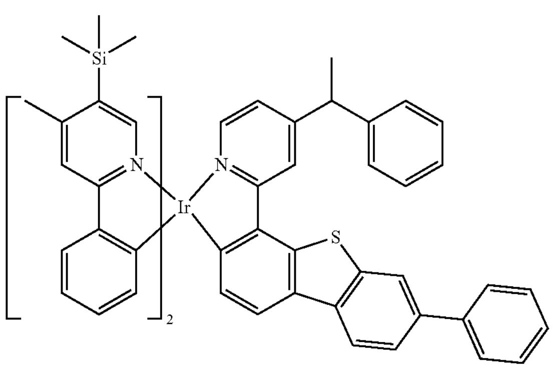
-continued
711
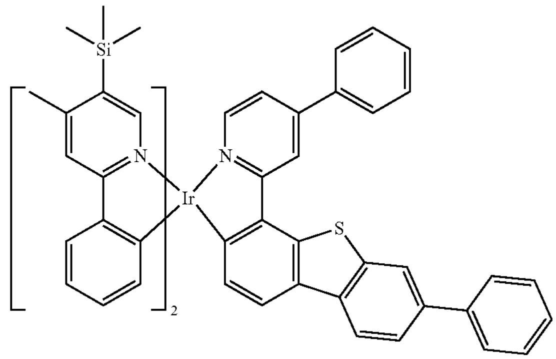
712
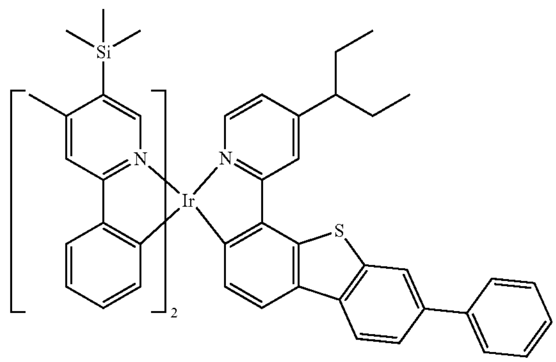
713
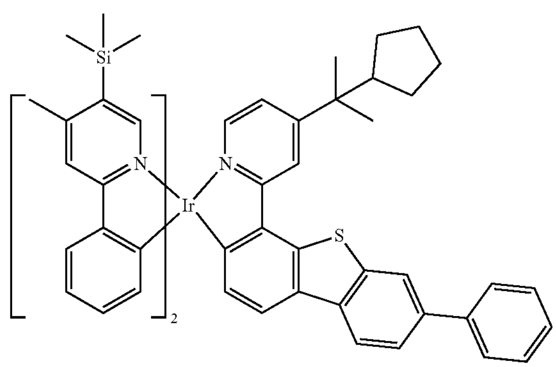
714
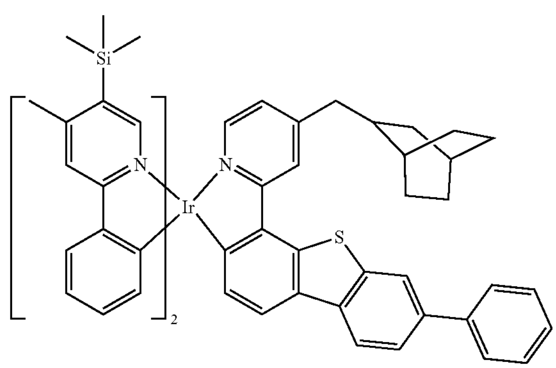

-continued
715
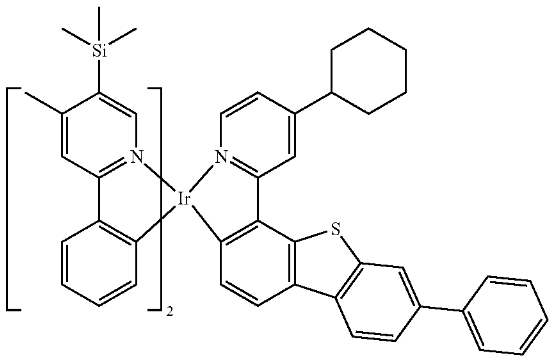
716
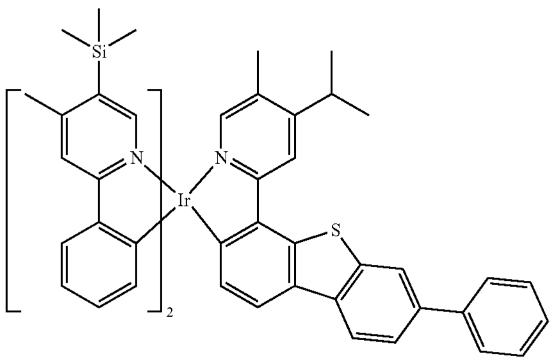
717
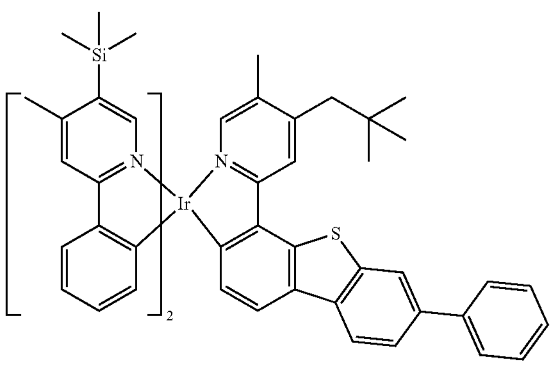
718
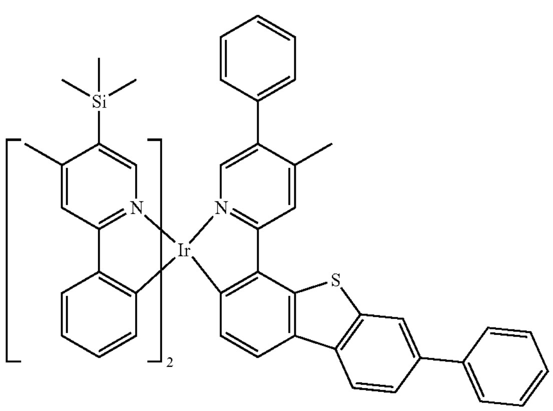
-continued
719
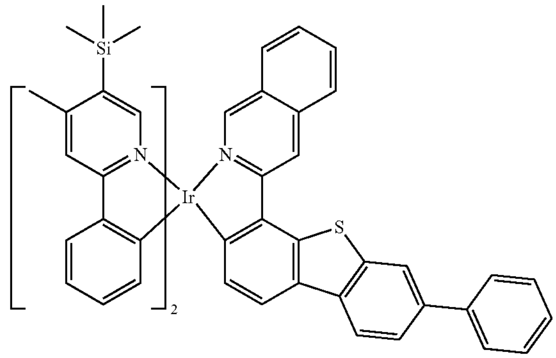
720
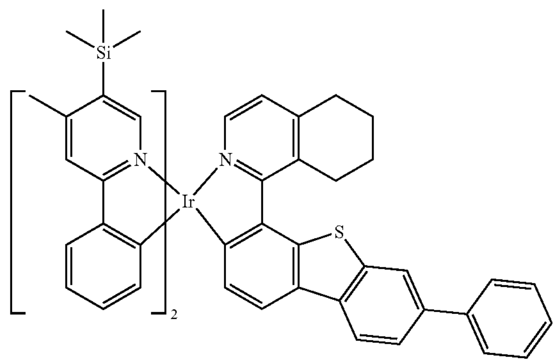
721
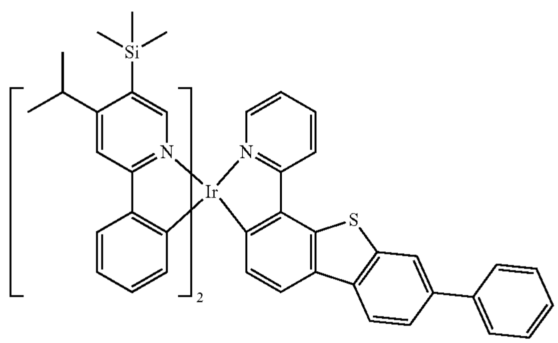
722
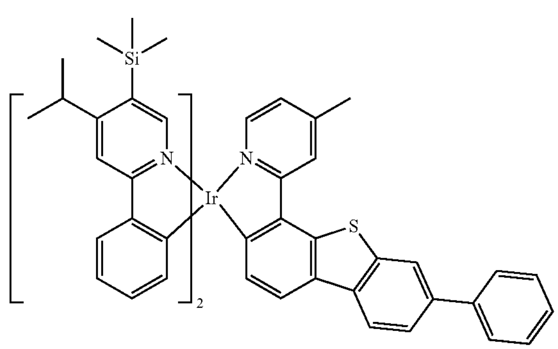

723
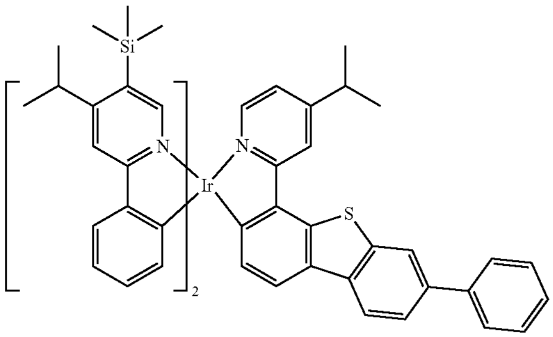
724
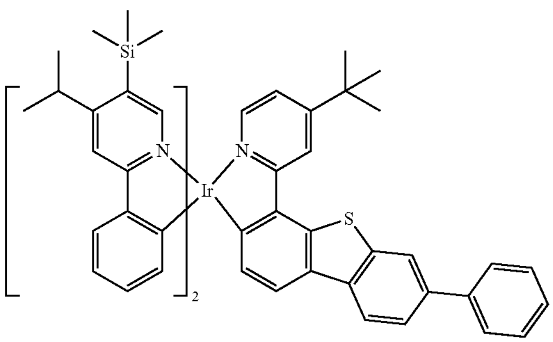
725
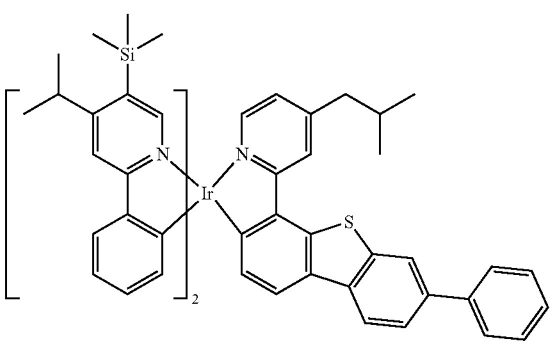
726
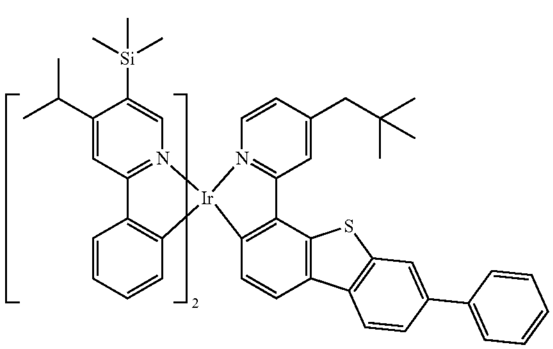
727
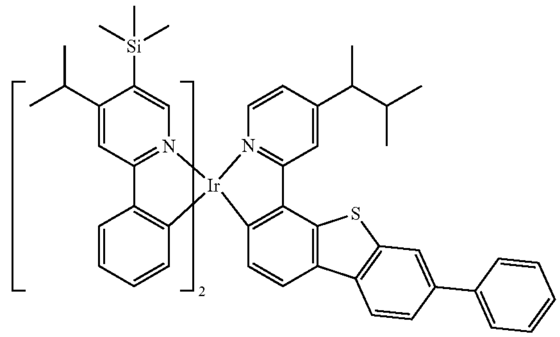
728
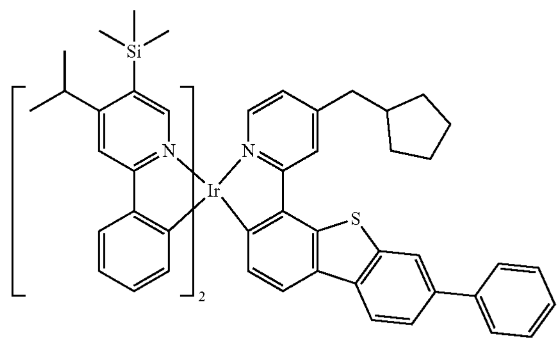
729
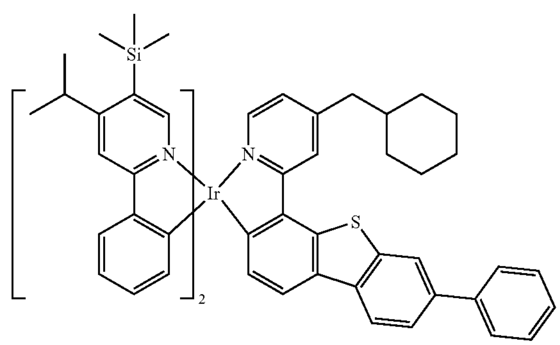
730
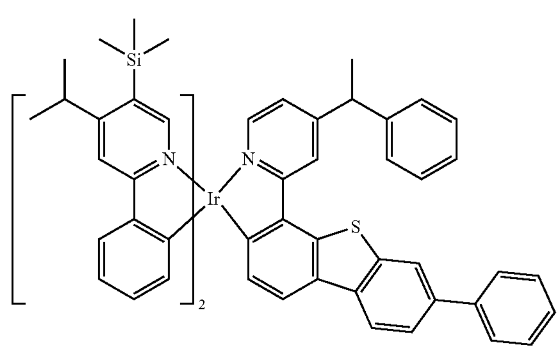

731
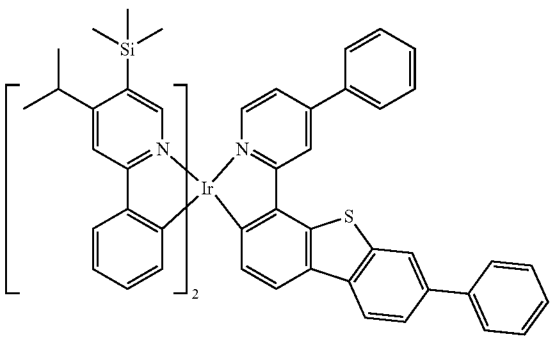
732
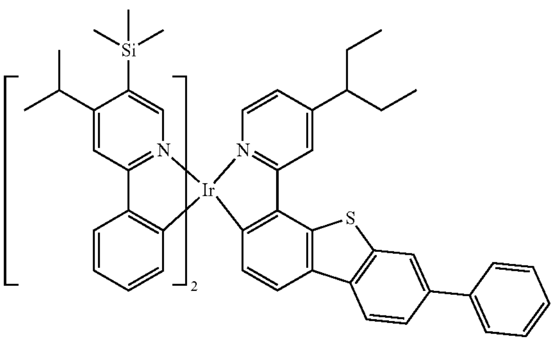
733
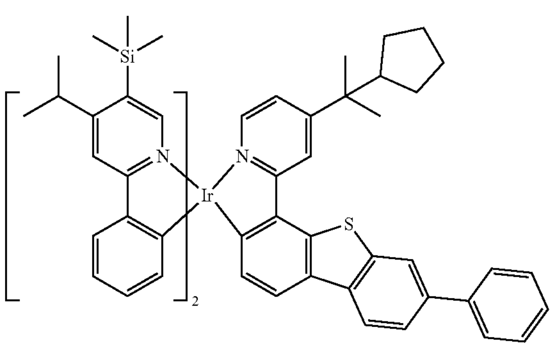
734
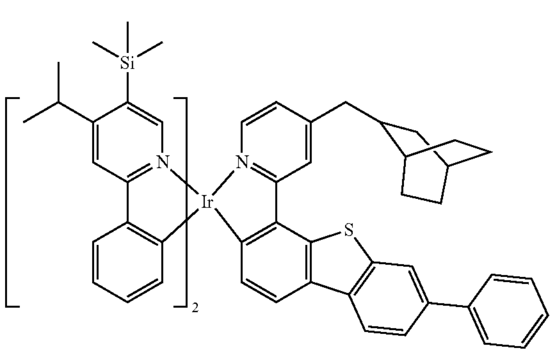
735
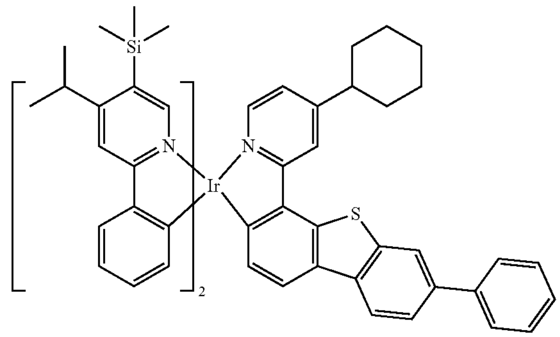
736
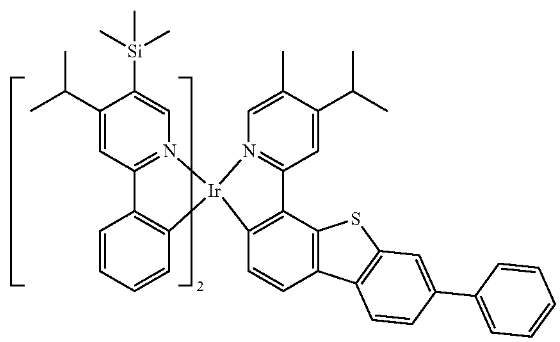
737
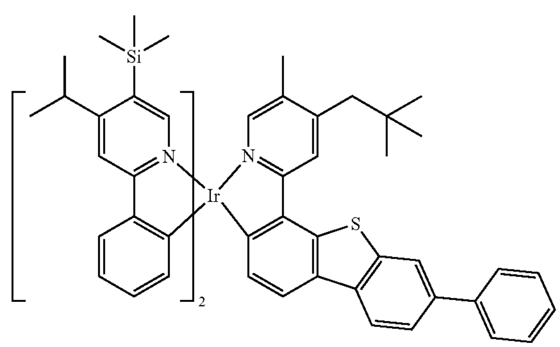
738
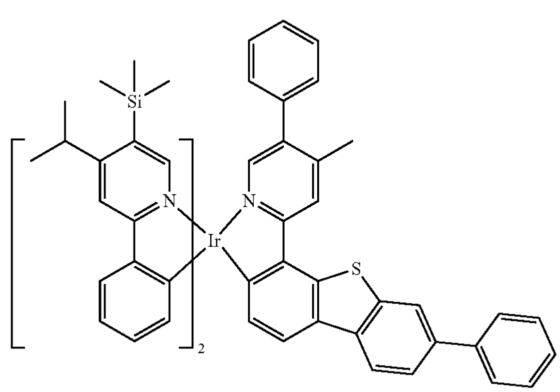

-continued
739
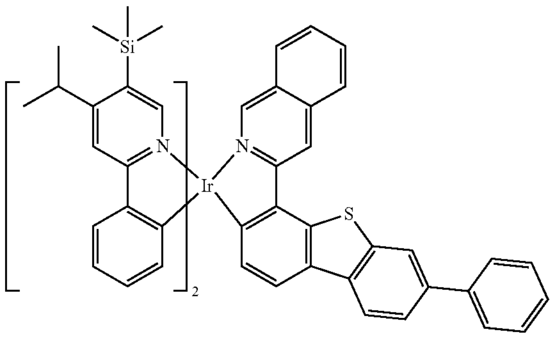
740
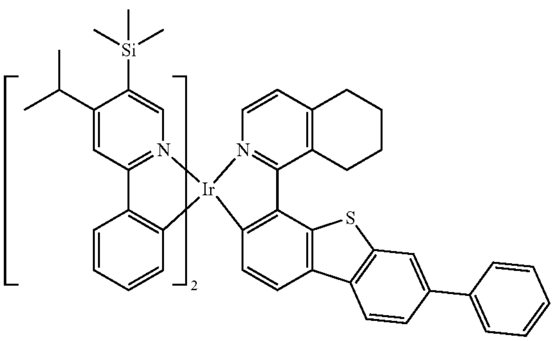
741
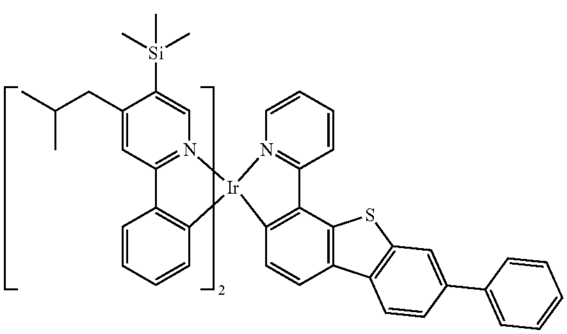
742
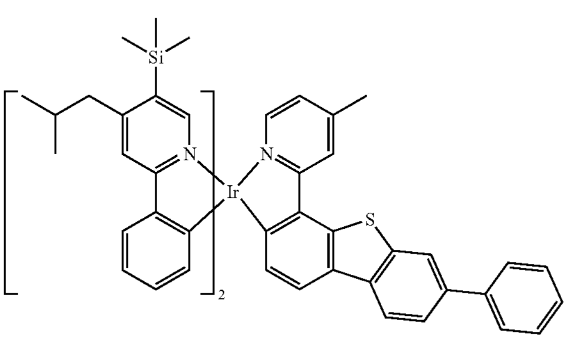
-continued
743
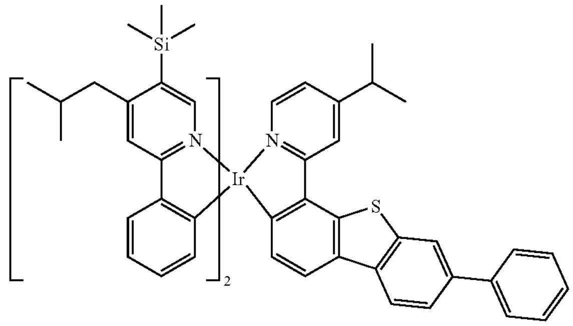
744
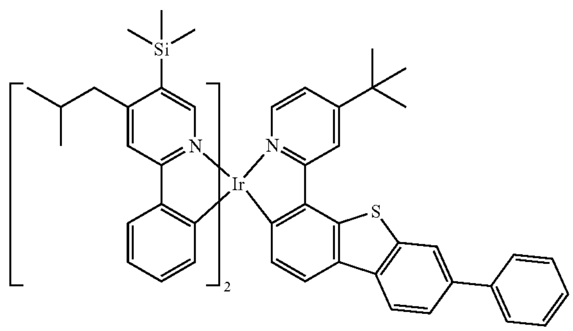
745
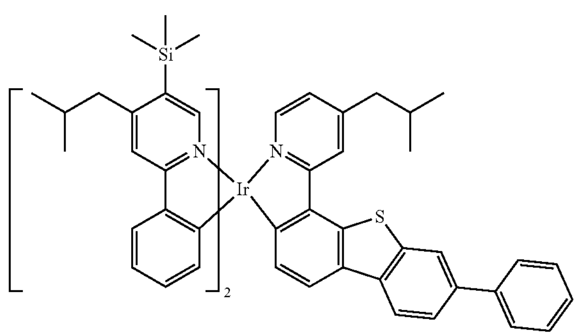
746
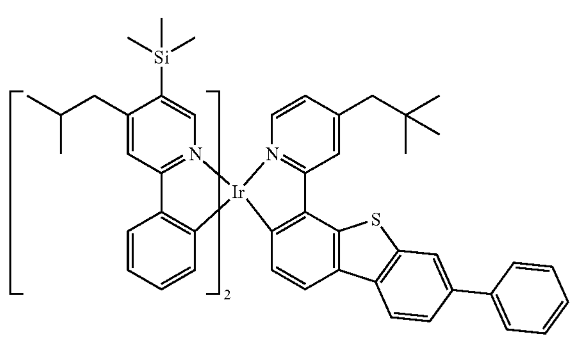

-continued
747
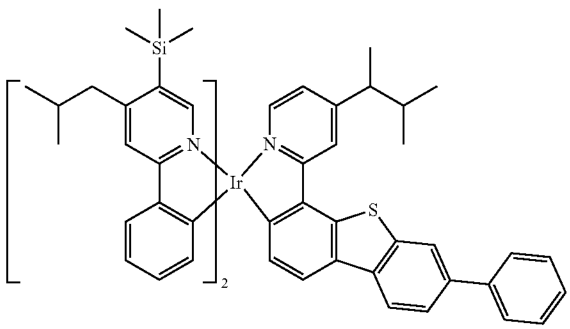
748
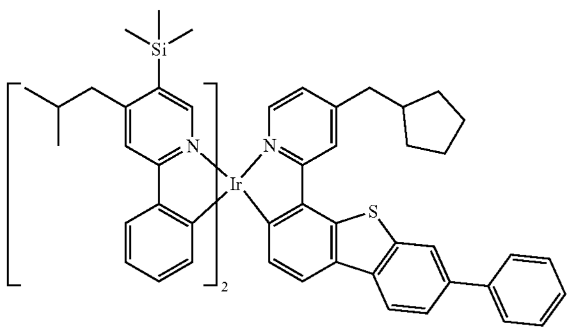
749
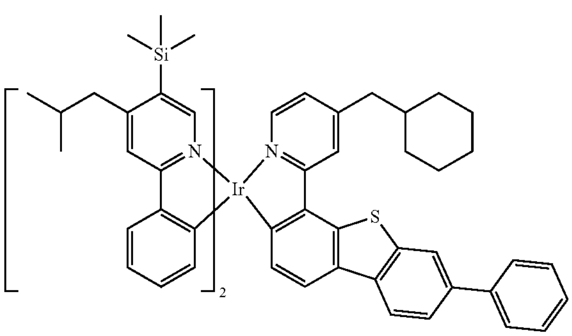
750
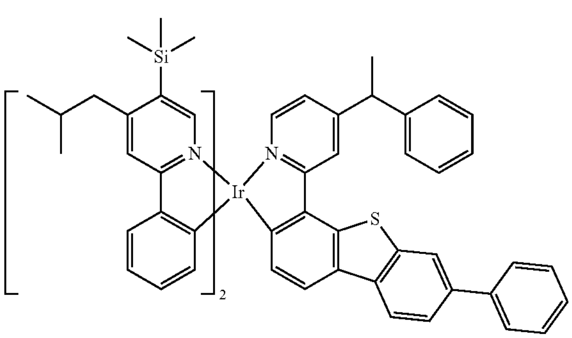
-continued
751
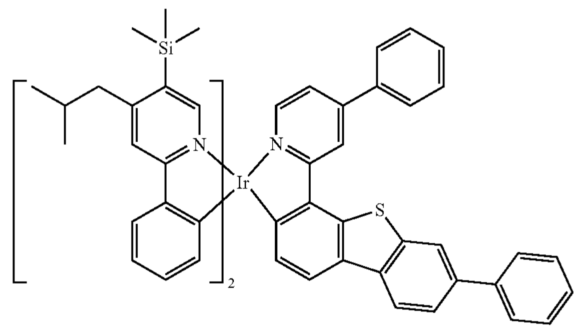
752
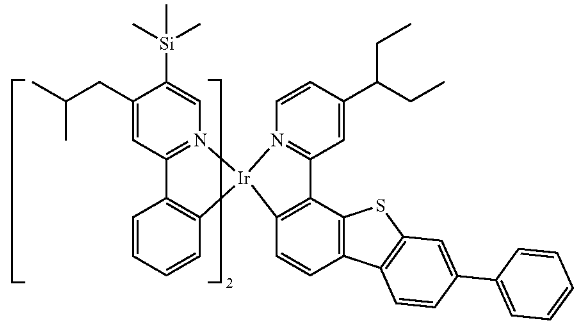
753
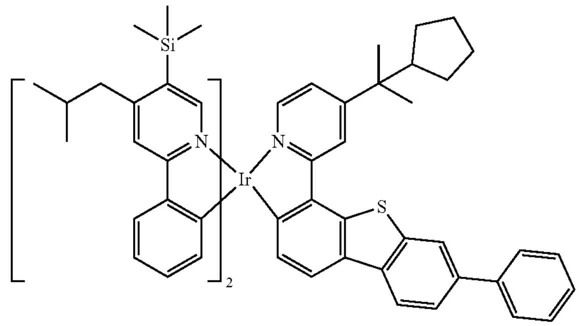
754
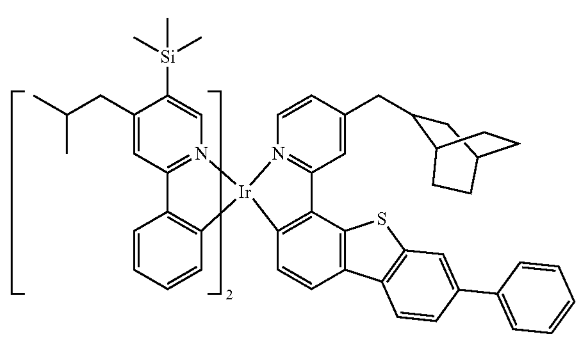

755
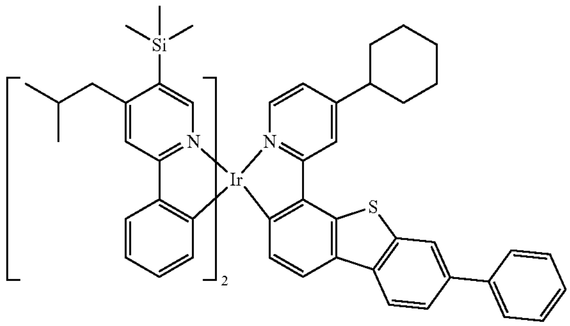
756
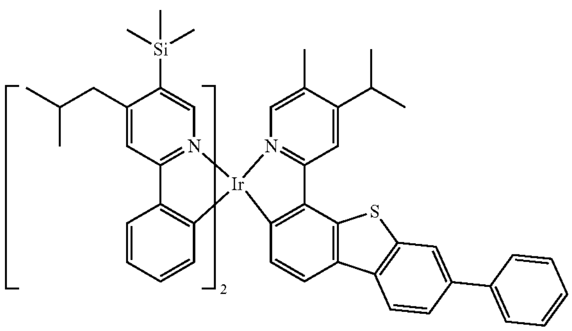
757
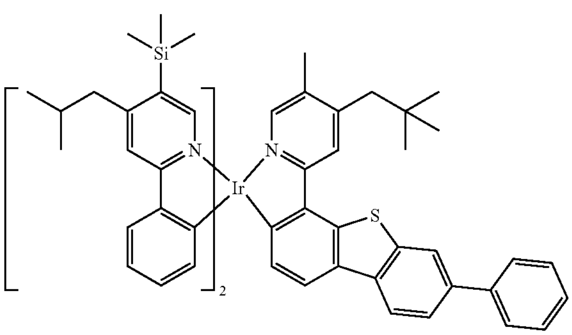
758
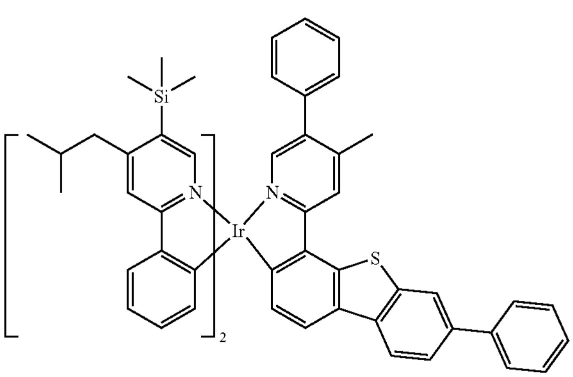
759
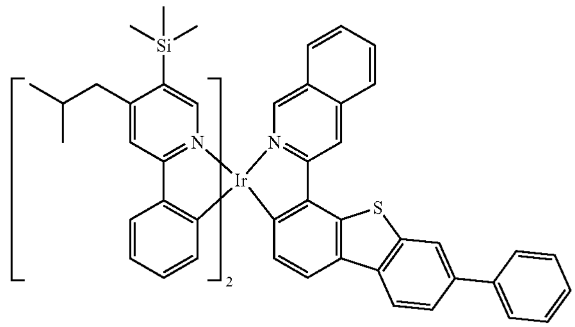
760
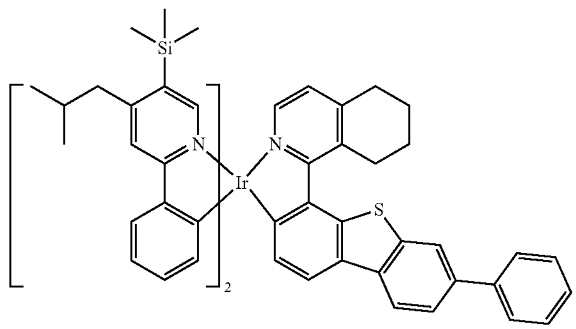
761
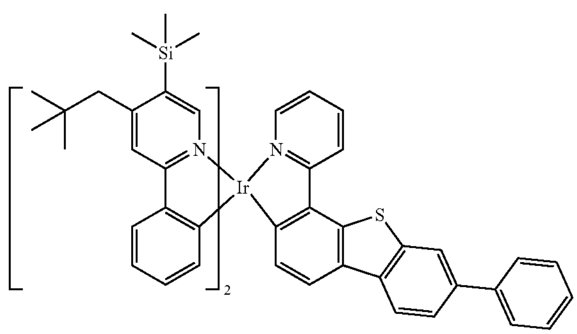
762
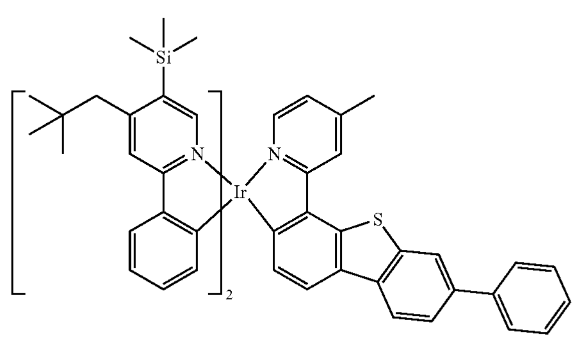

-continued
763
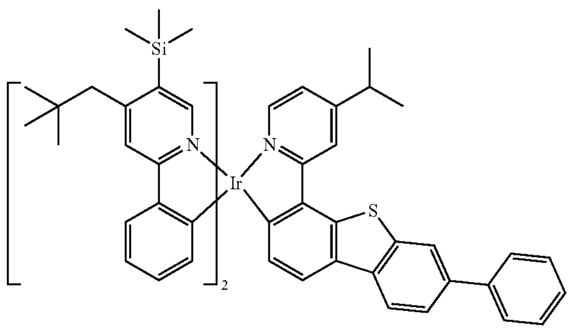
764
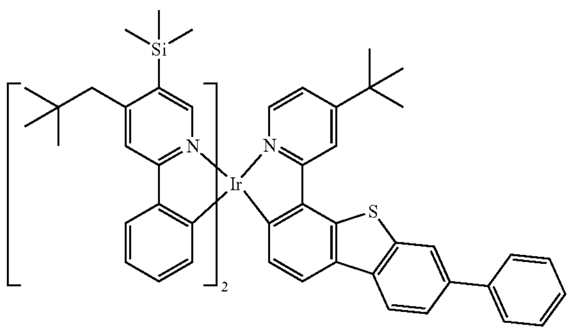
765
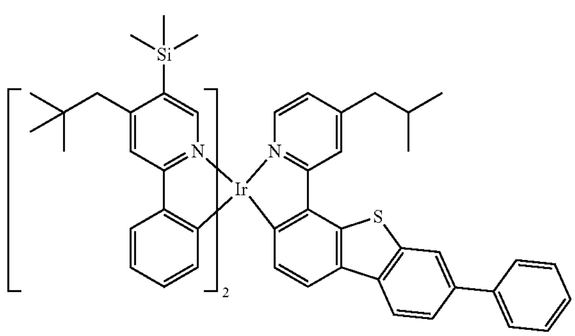
766
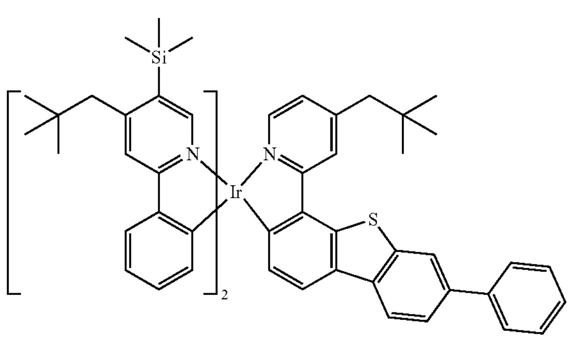
-continued
767
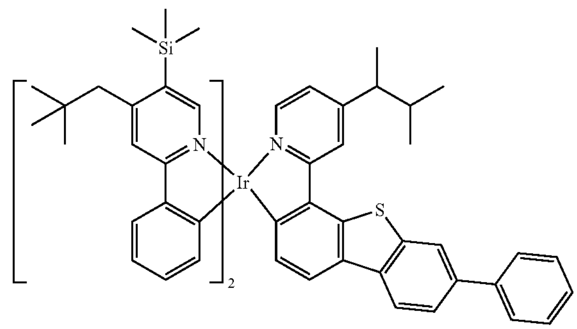
768
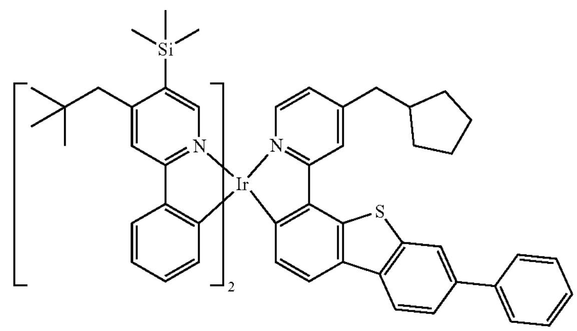
769
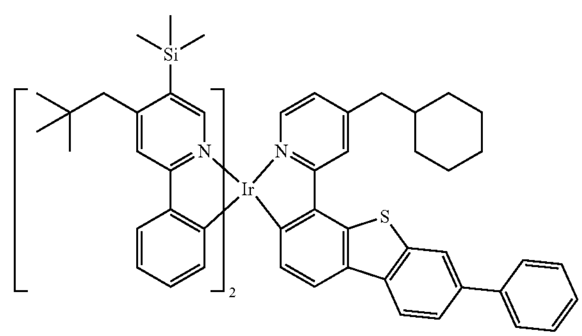
770
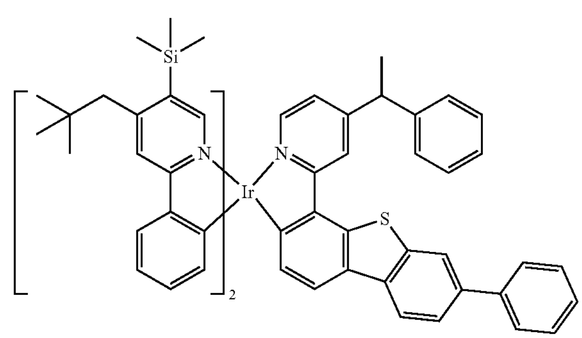

771
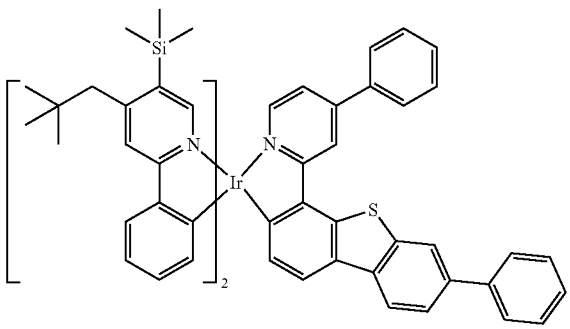
772
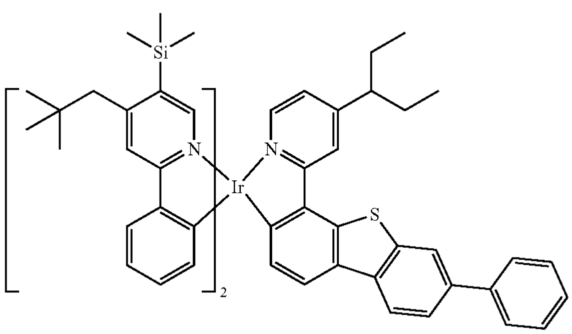
773
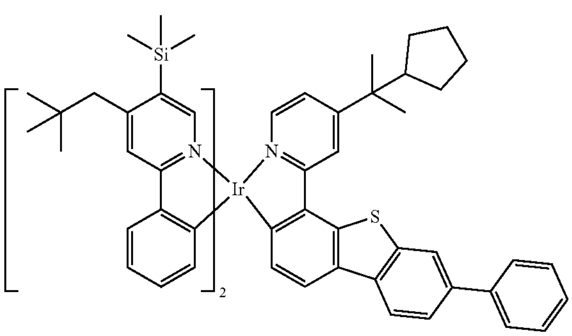
774
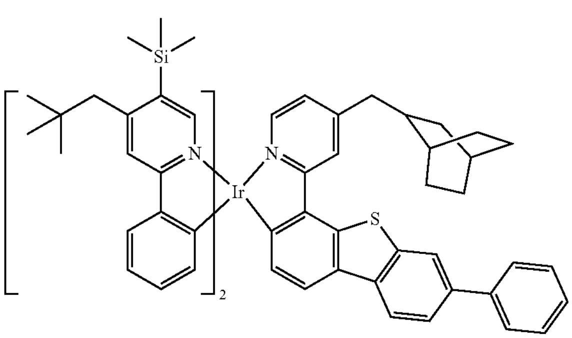
775
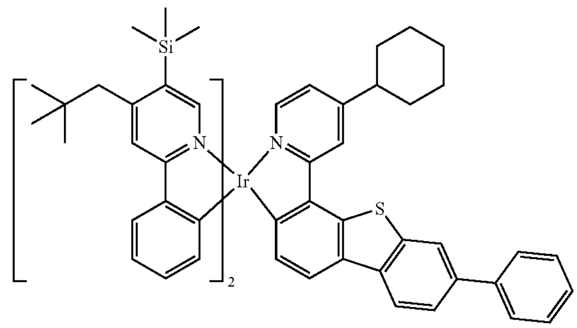
776
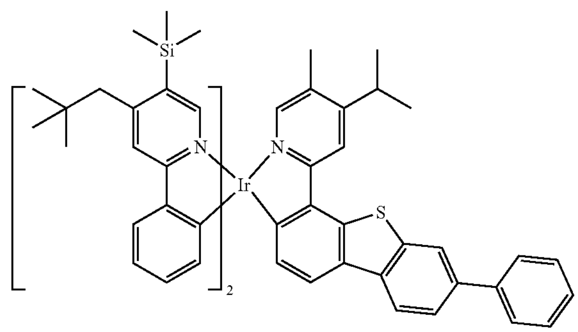
777
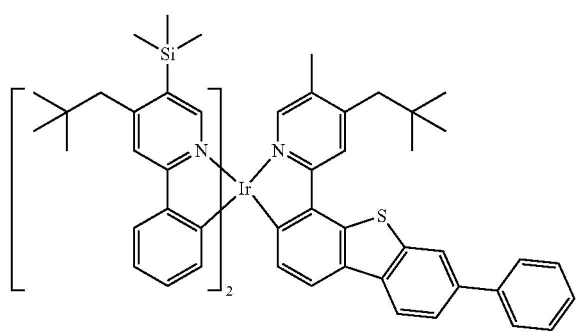
778
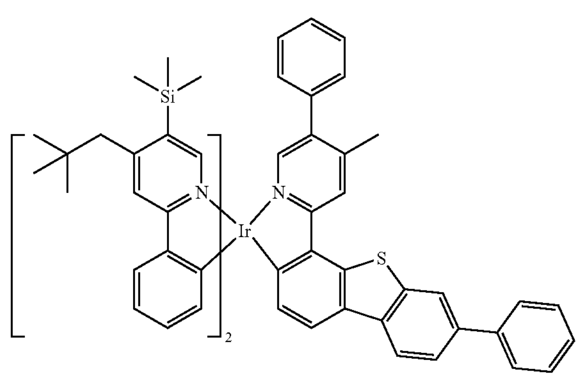

-continued
779
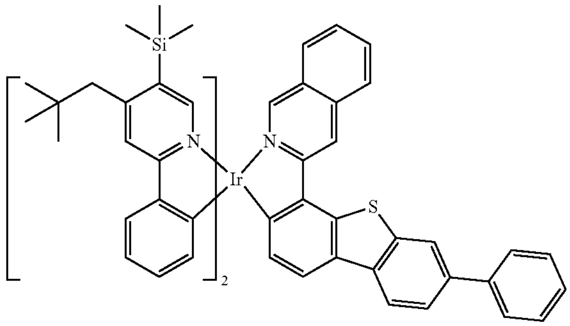
780
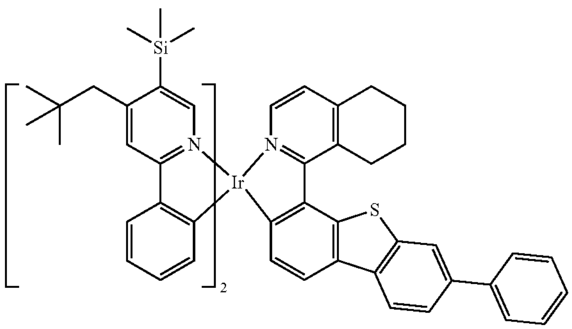
781
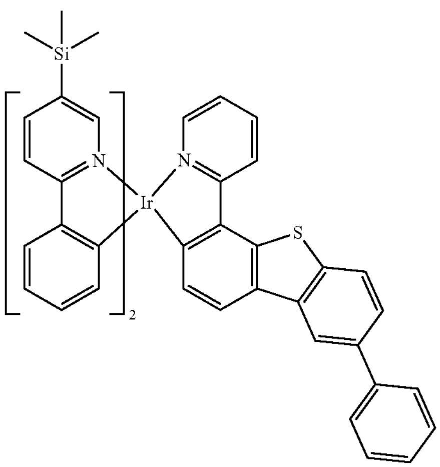
782
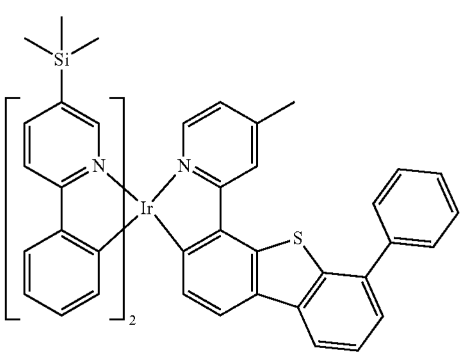
-continued
783
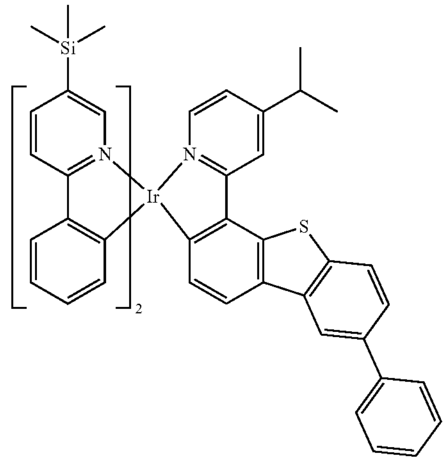
784
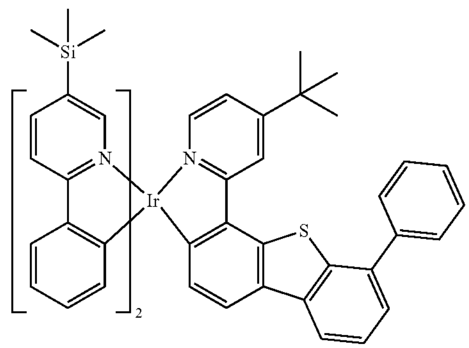
785
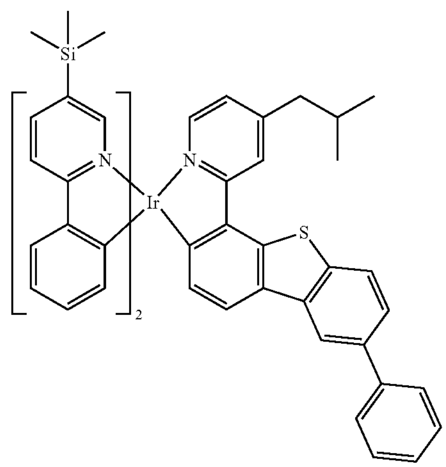
786
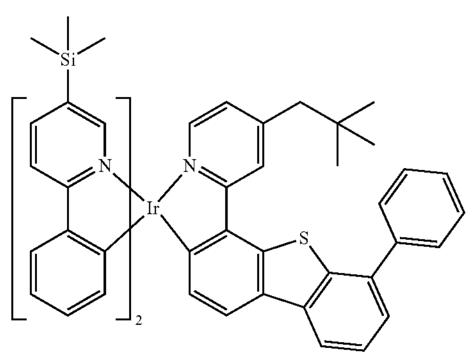

787
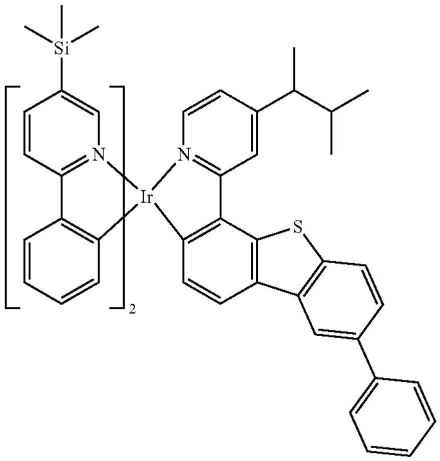
788
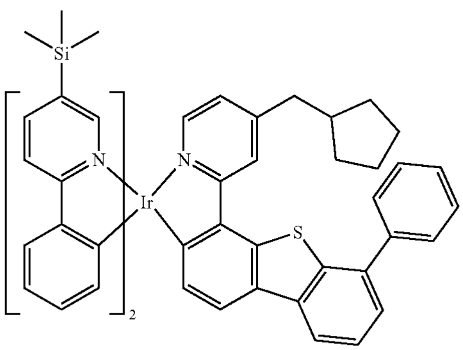
789
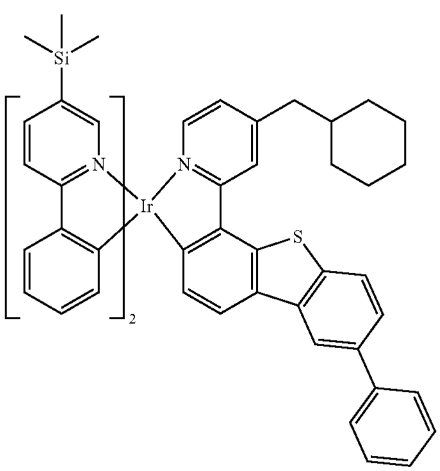
790
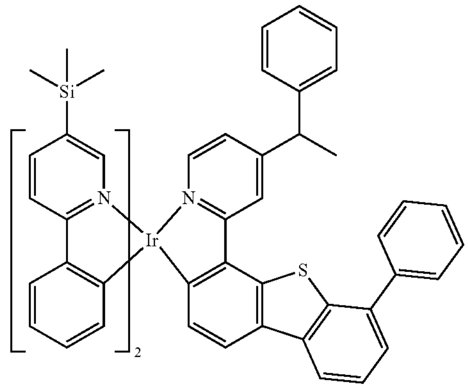
791
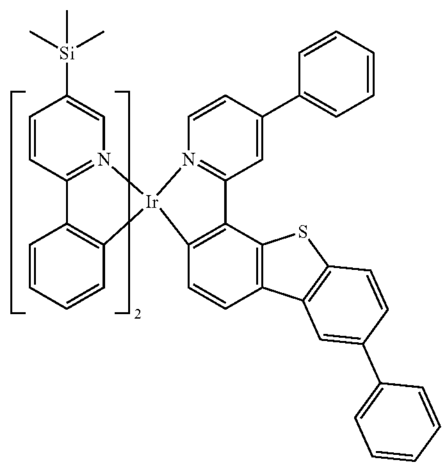
792
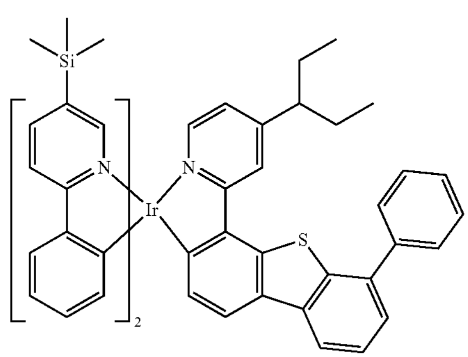

793
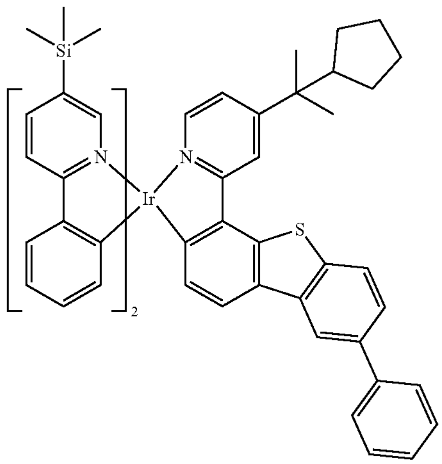
794
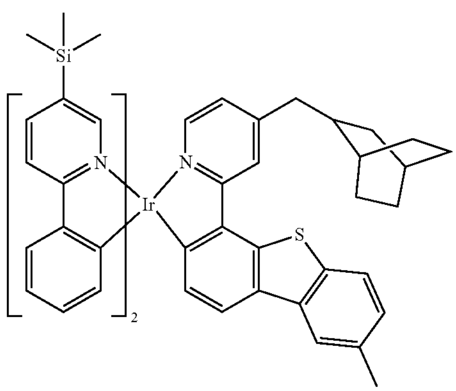
795
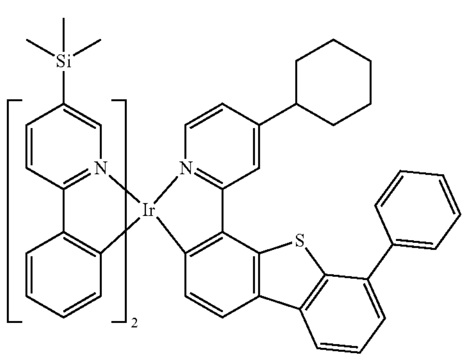
796
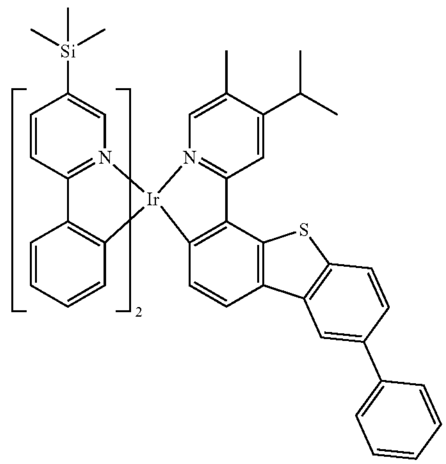
797
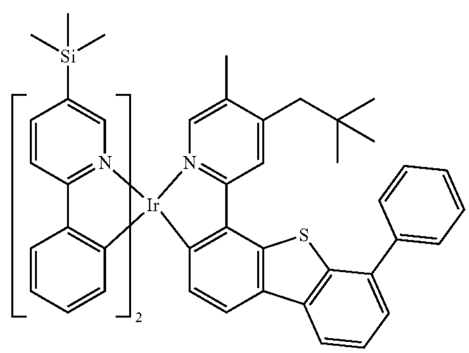
798
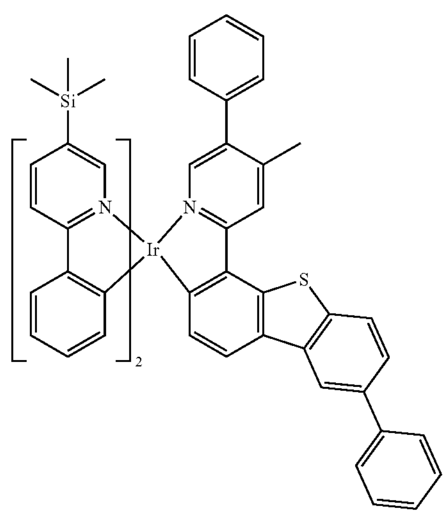

799
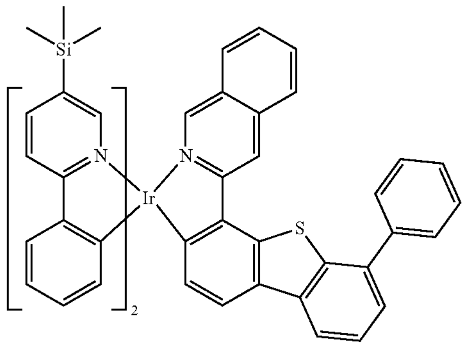
800
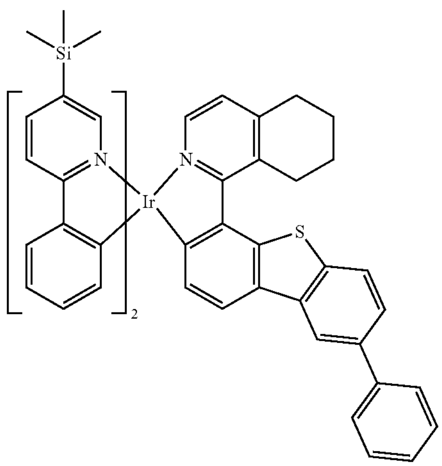
801
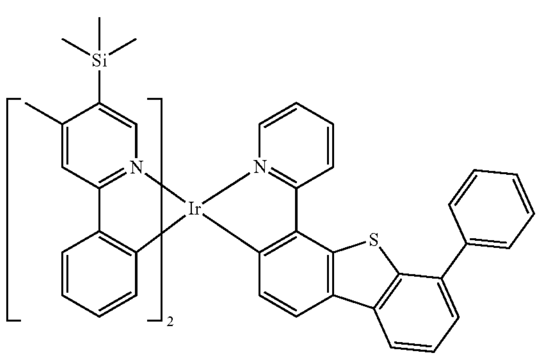
802
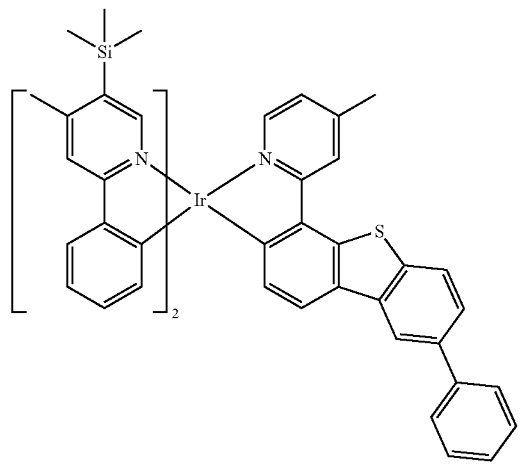
803
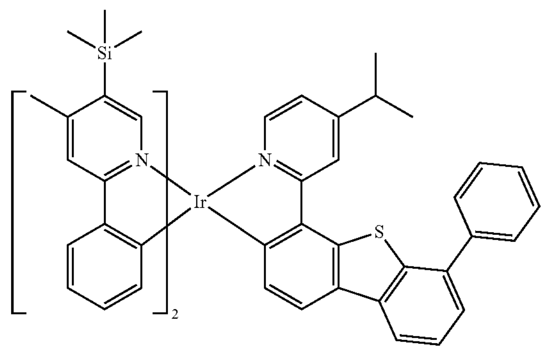
804
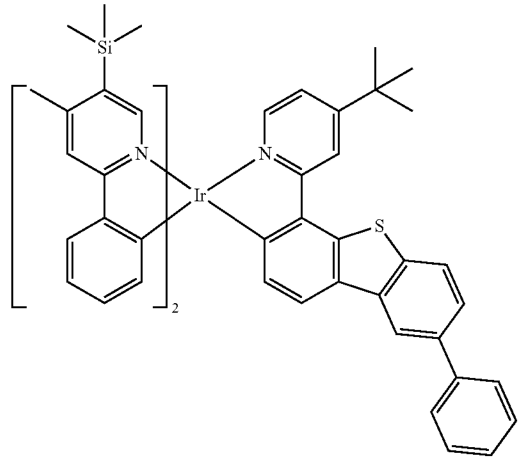

-continued
805
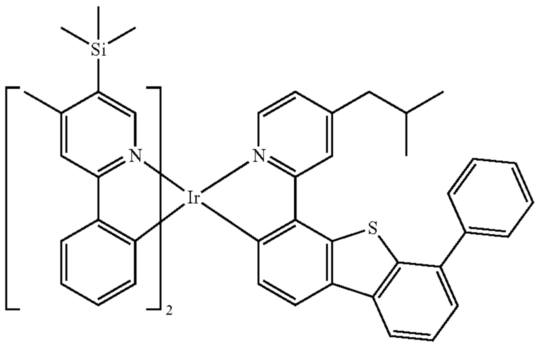
806
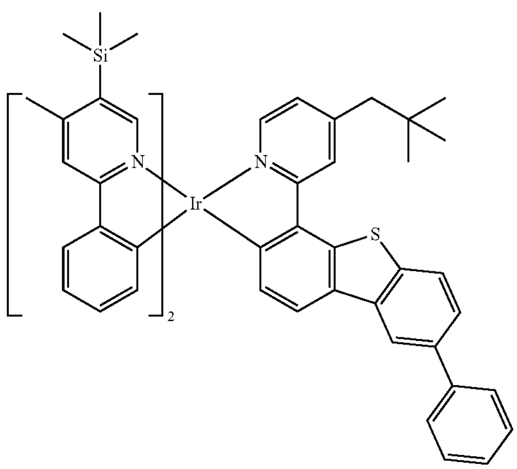
807
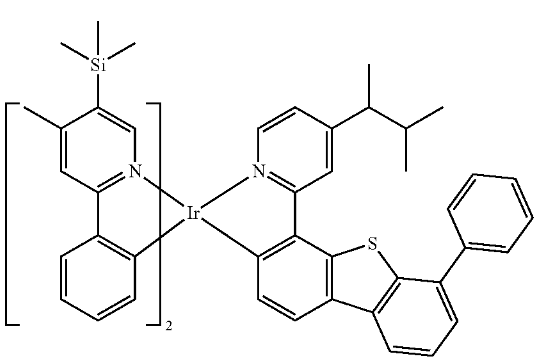
-continued
808
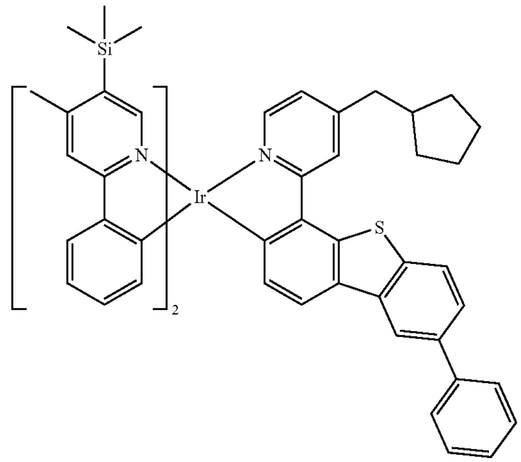
809
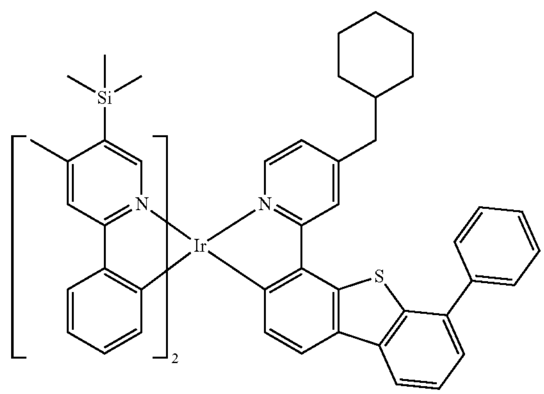
810
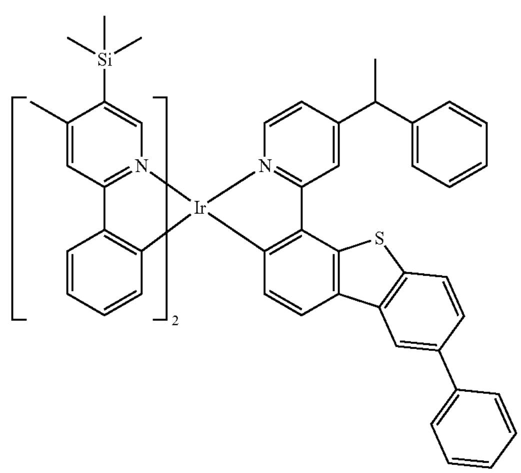

-continued
811
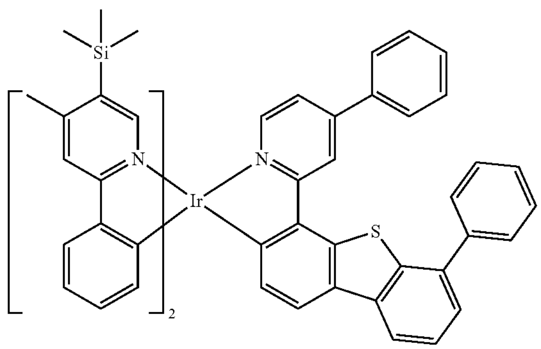
812
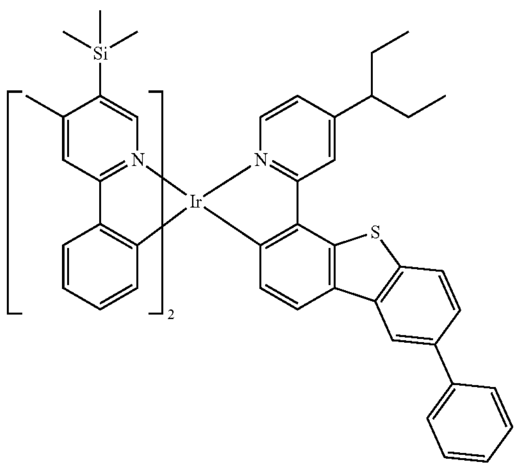
813
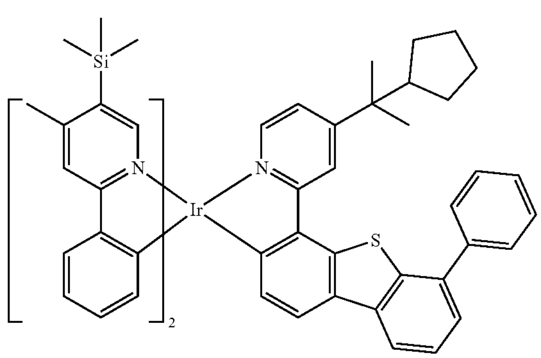
-continued
814
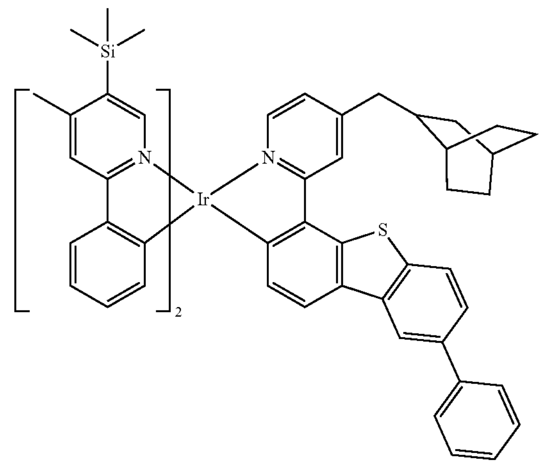
815
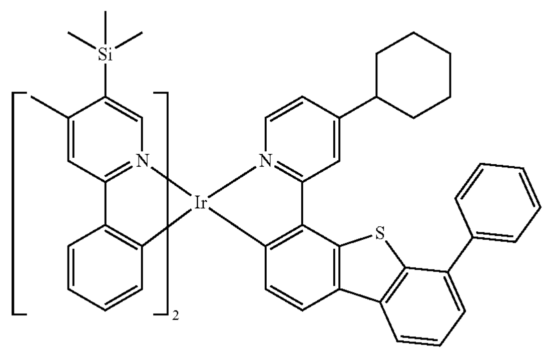
816
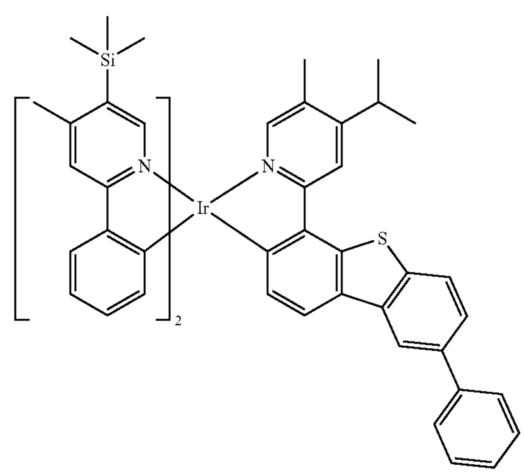

817
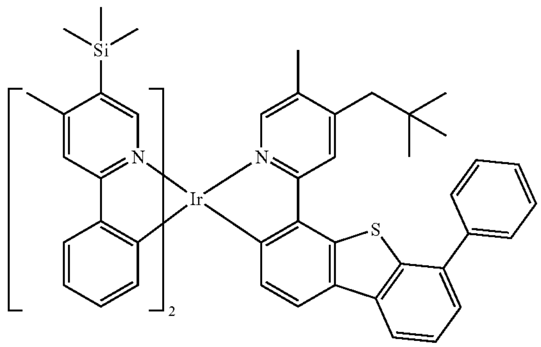
818
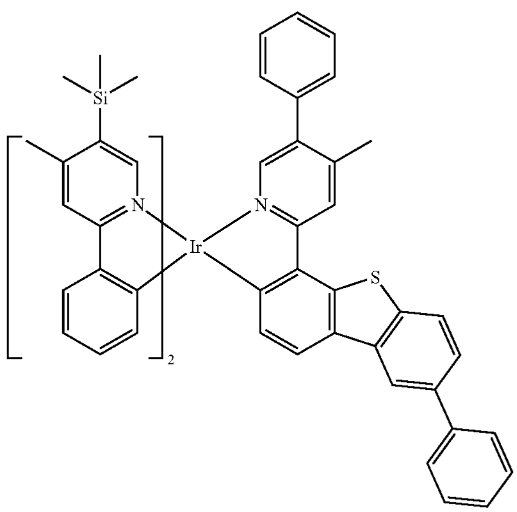
819
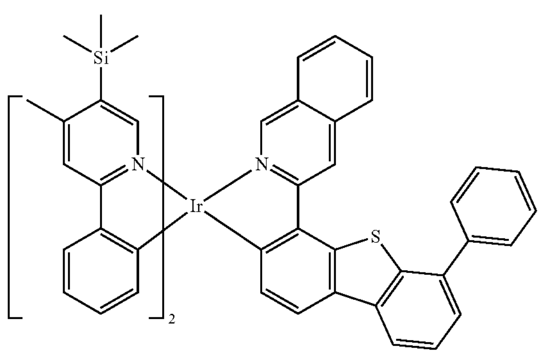
820
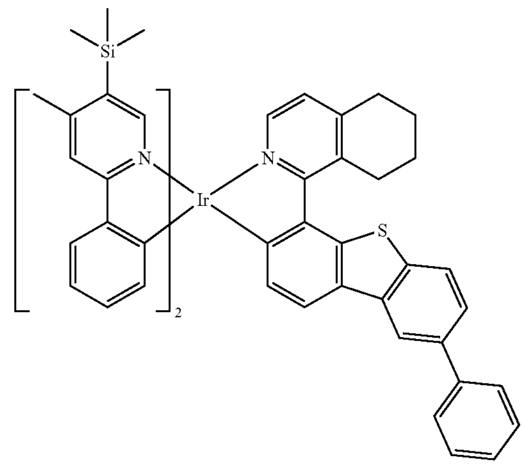
821
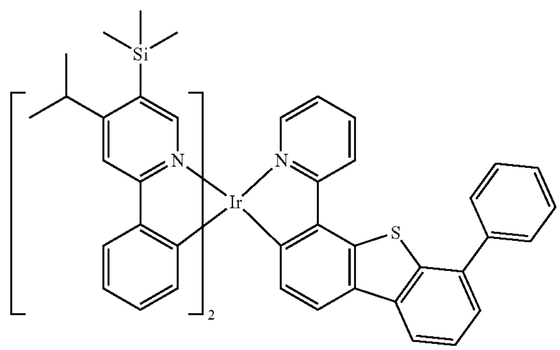
822
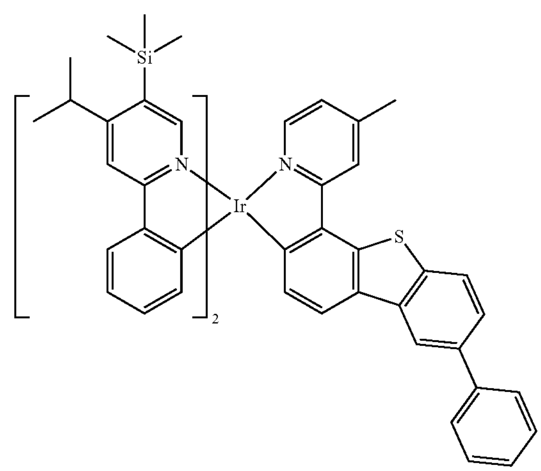

-continued
823
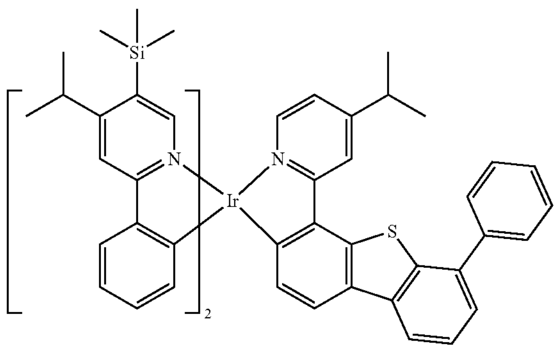
824
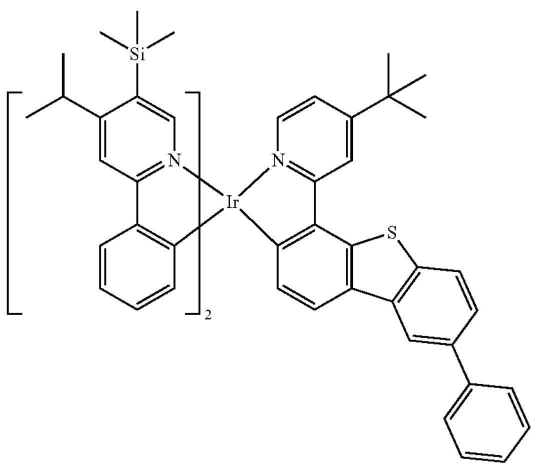
825
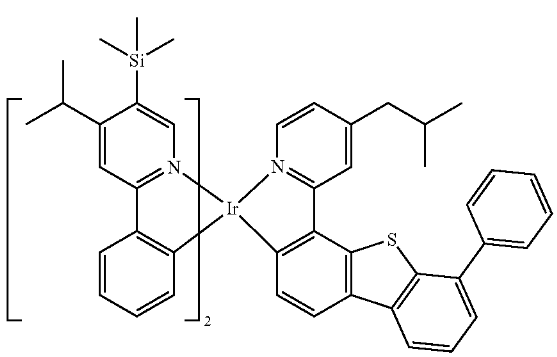
-continued
826
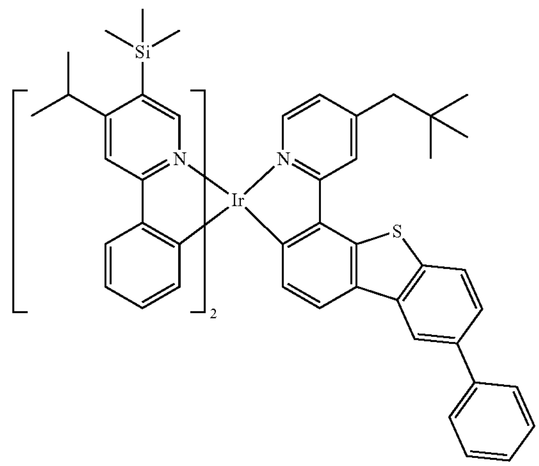
827
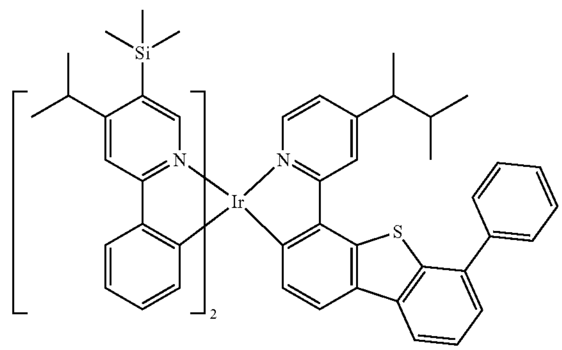
828
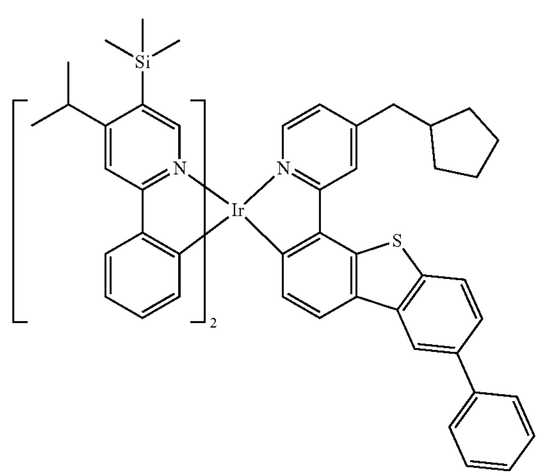

-continued
829
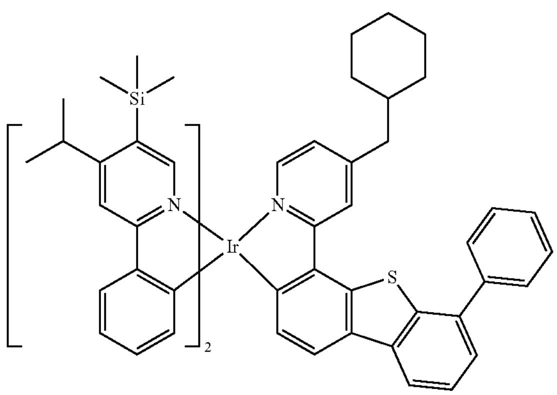
830
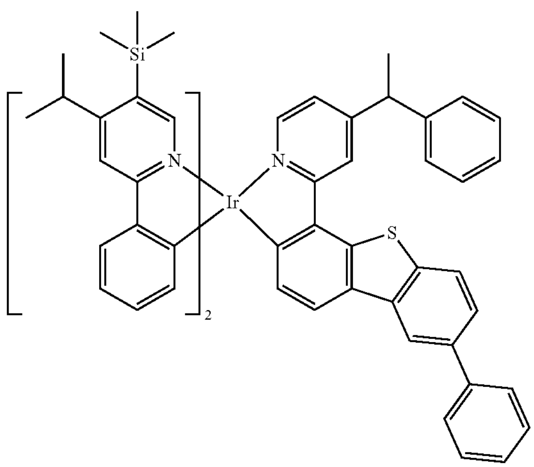
831
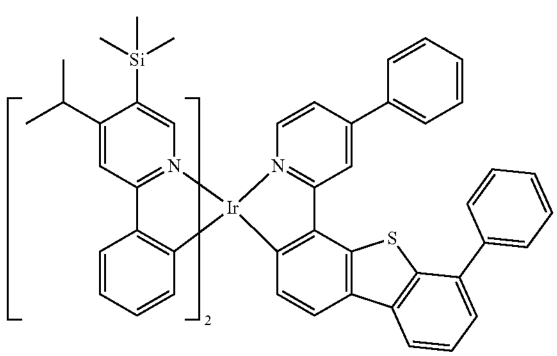
-continued
832
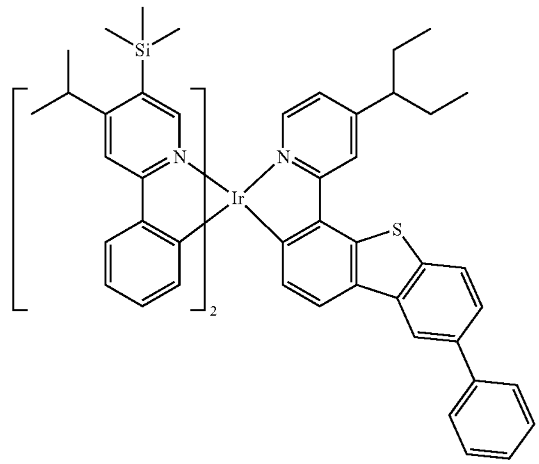
833
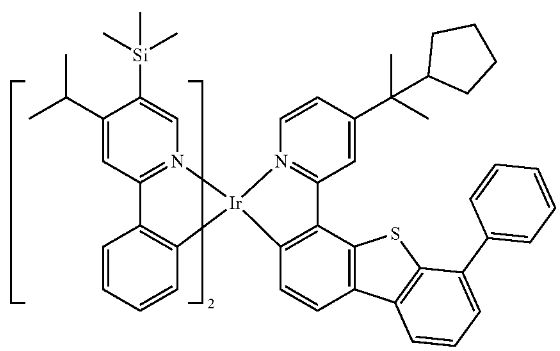
834
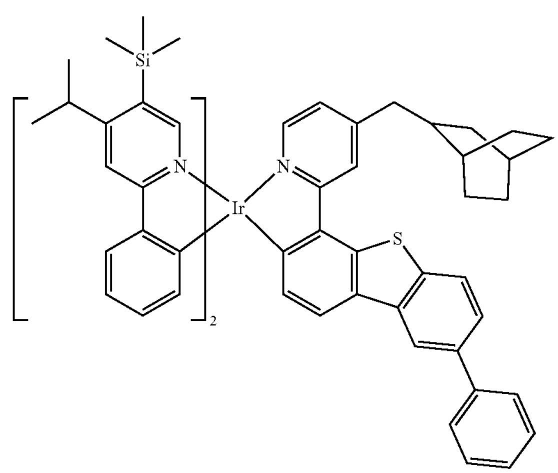

-continued
835
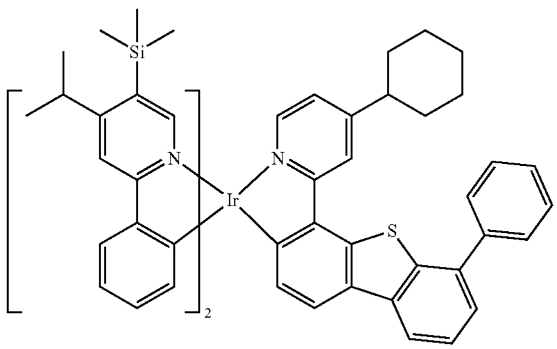
836
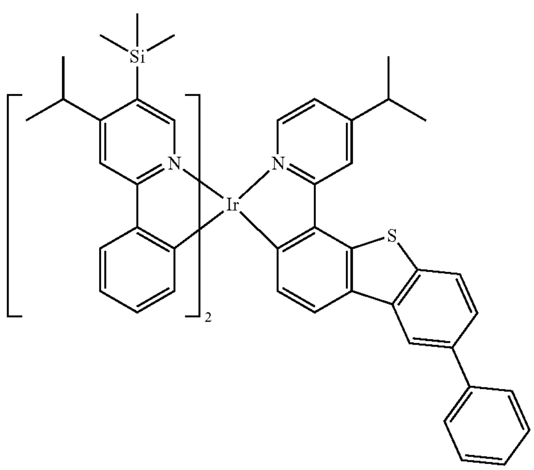
837
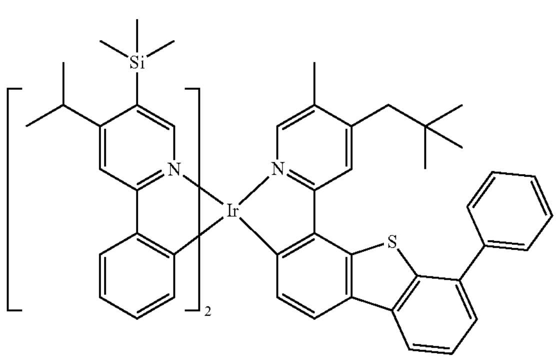
-continued
838
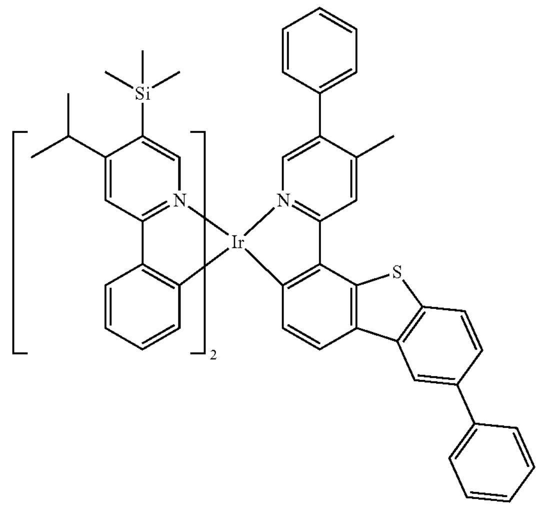
839
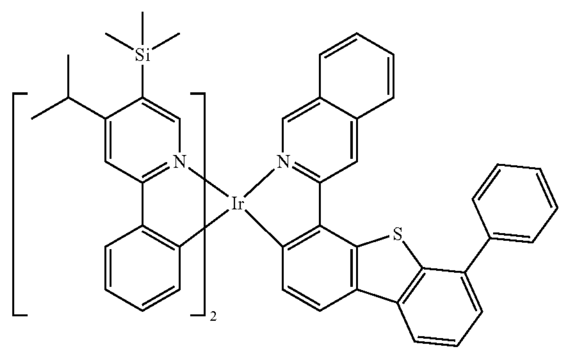
840
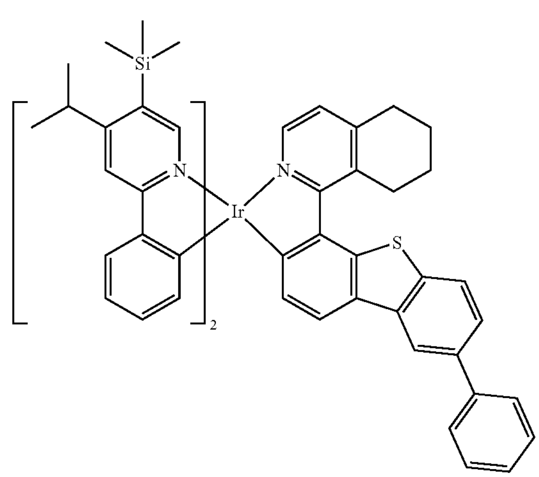

-continued
841
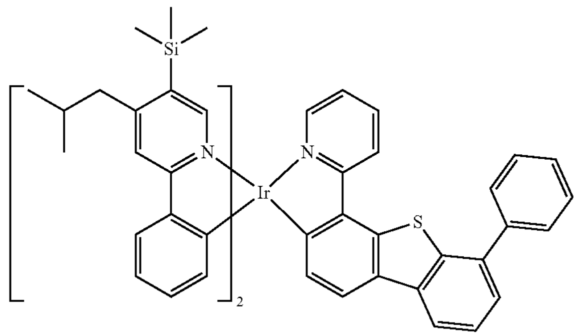
842
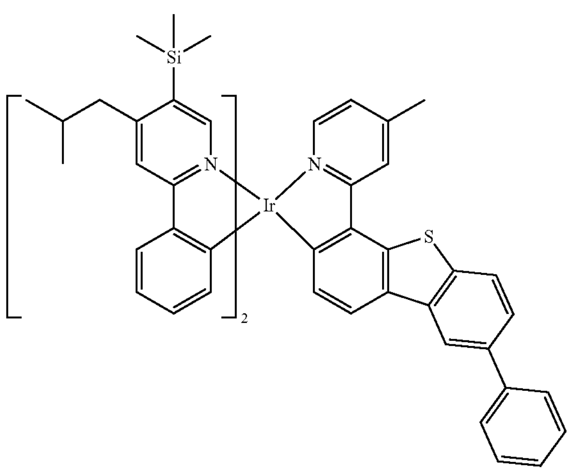
843
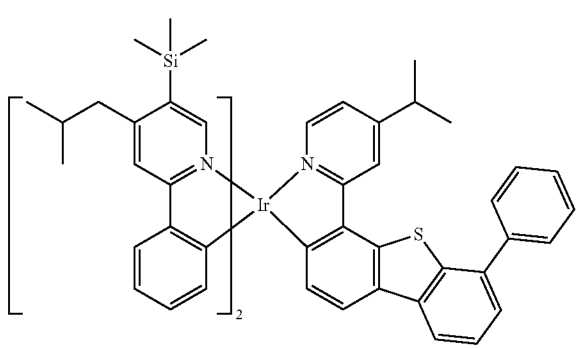
-continued
844
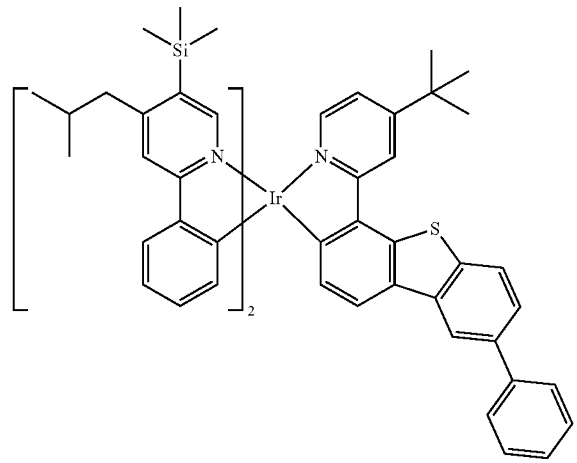
845
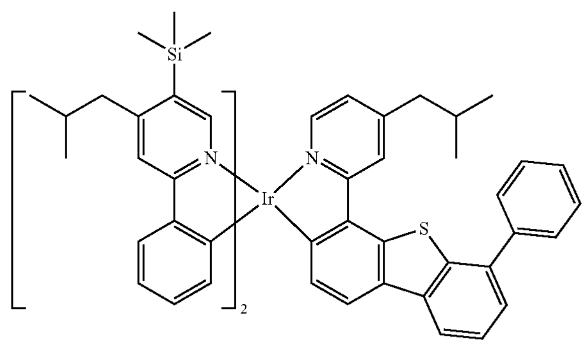
846
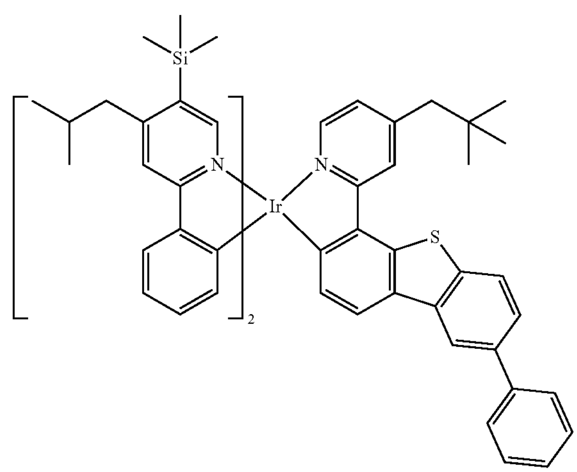

-continued
847
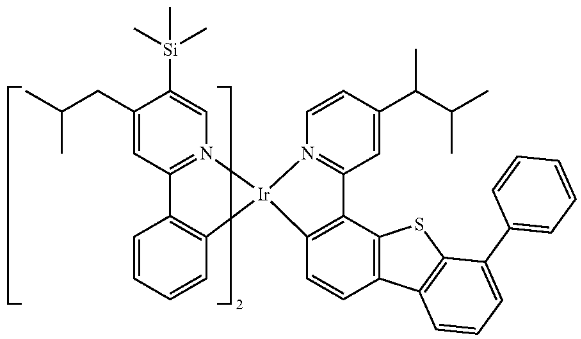
848
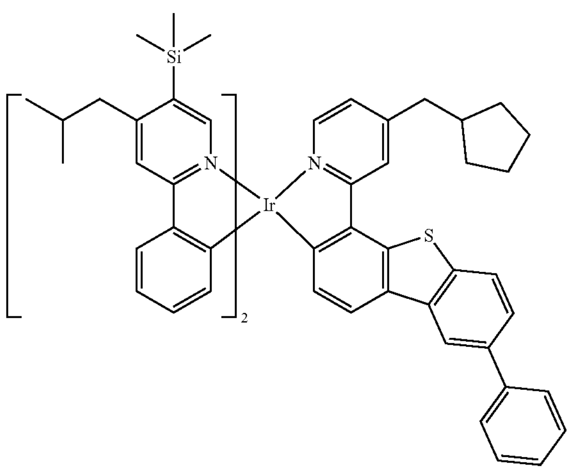
849
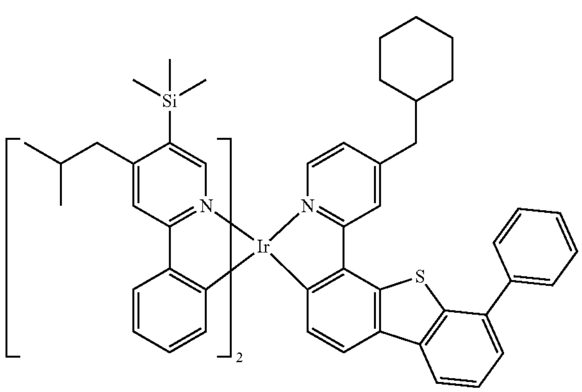
-continued
850
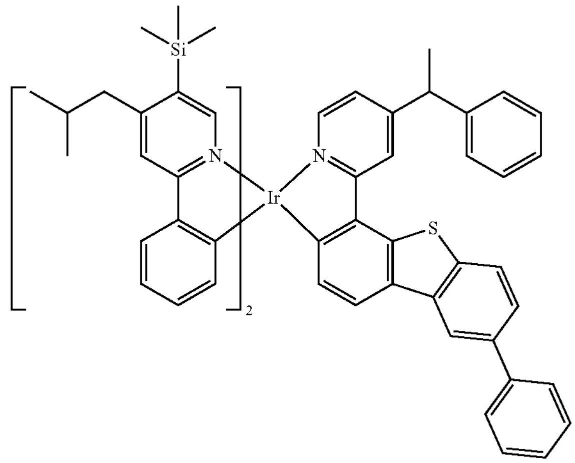
851
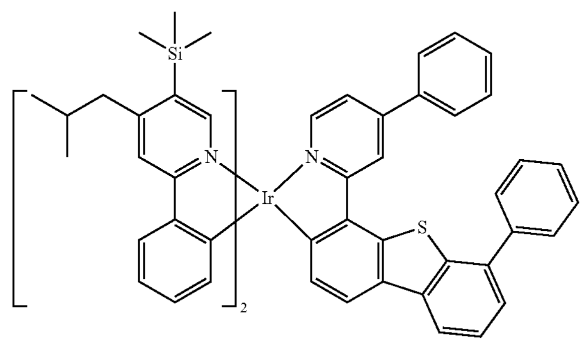
852
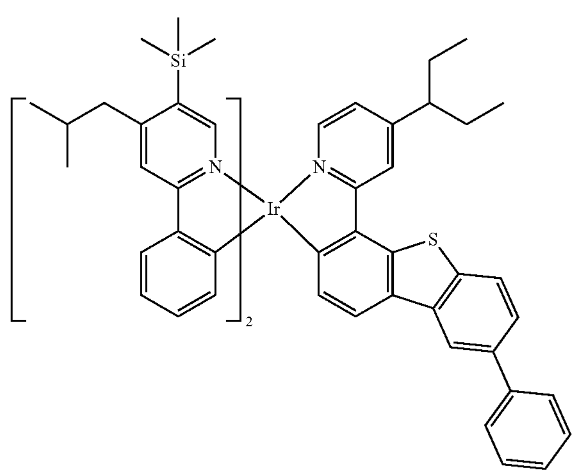

853
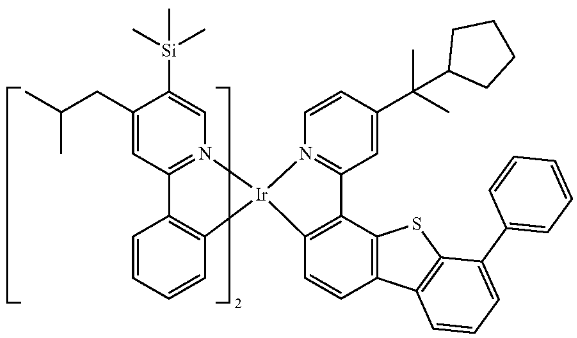
854
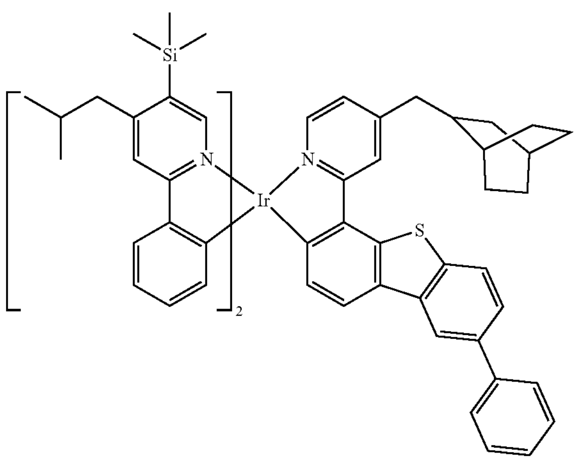
855
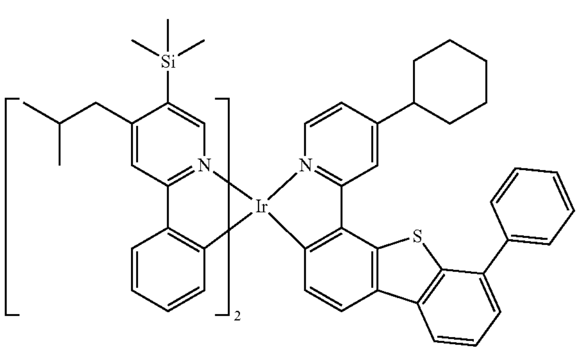
856
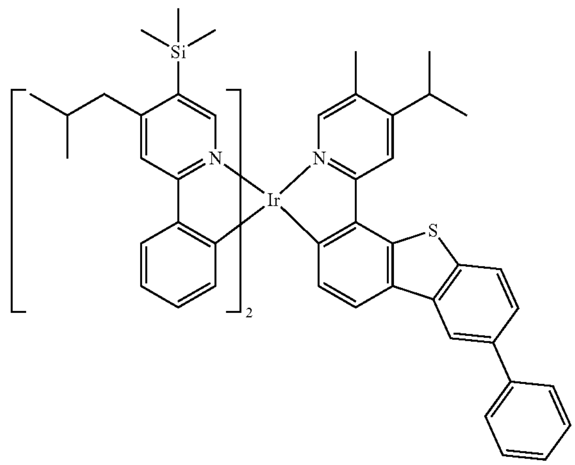
857
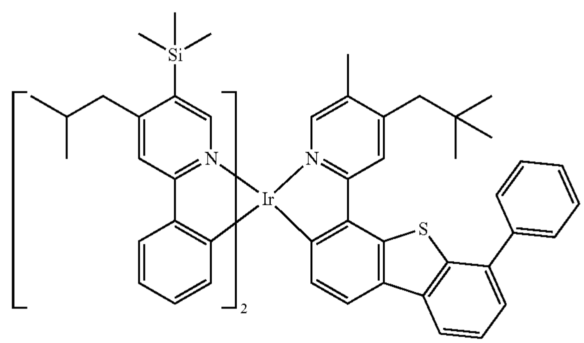
858
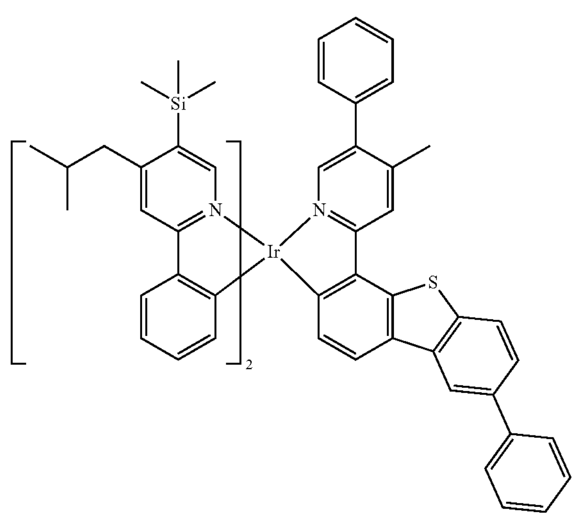

-continued
859
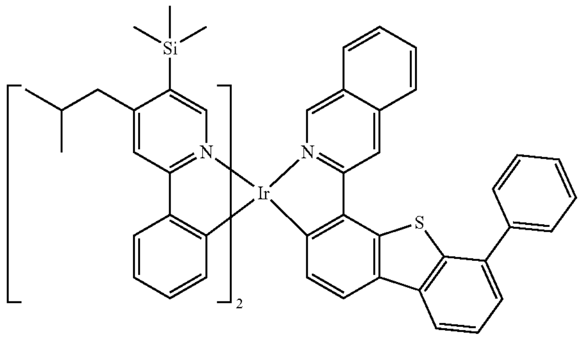
860
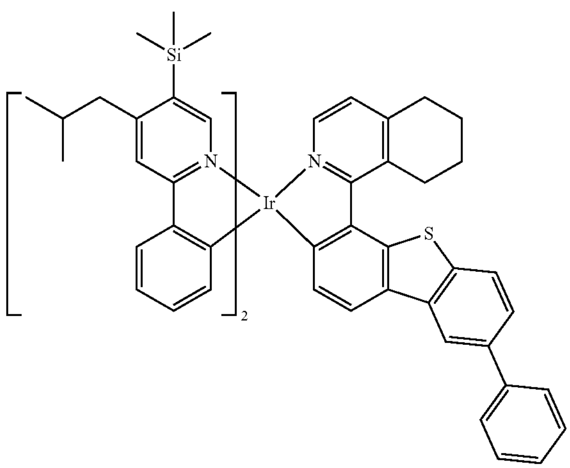
861
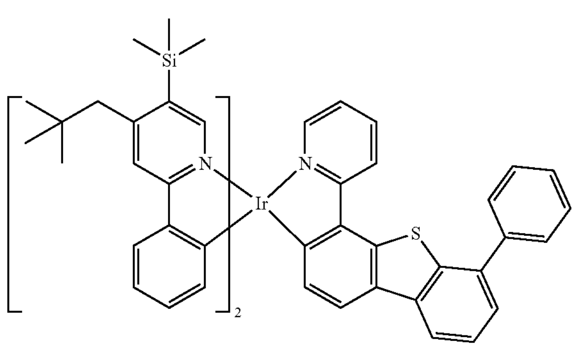
-continued
862
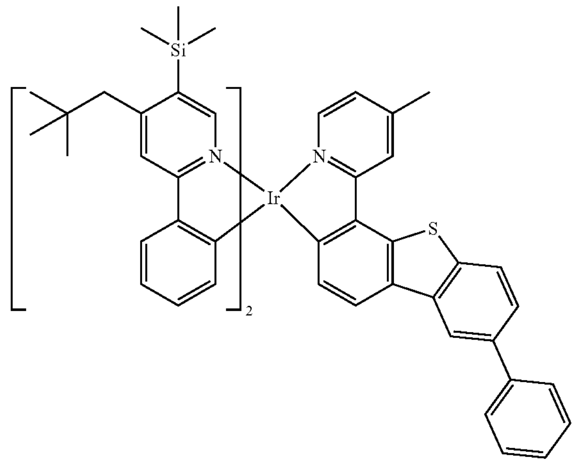
863
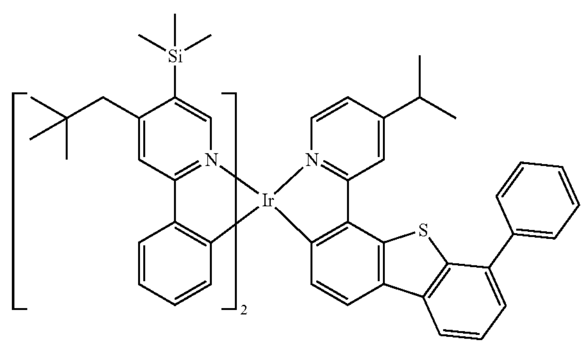
864
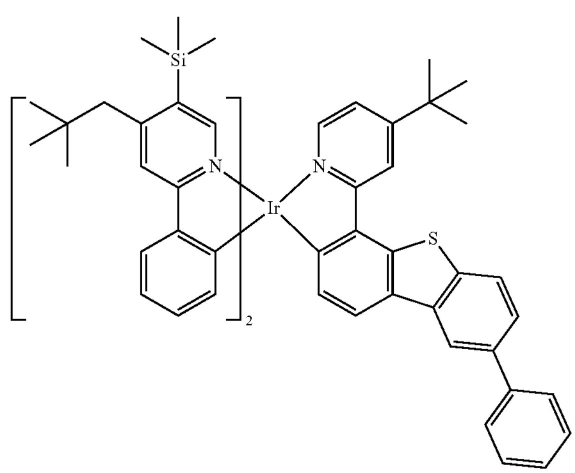

-continued
865
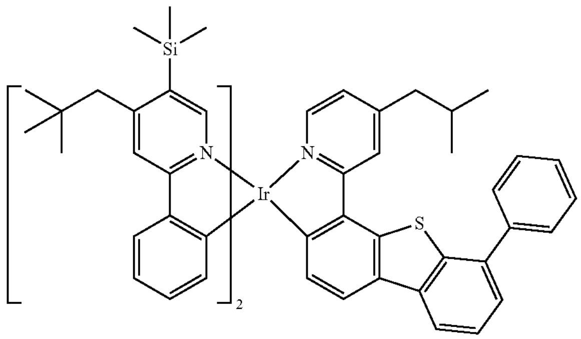
866
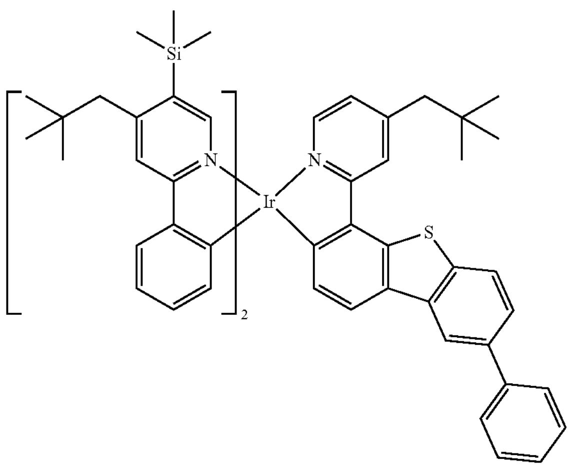
867
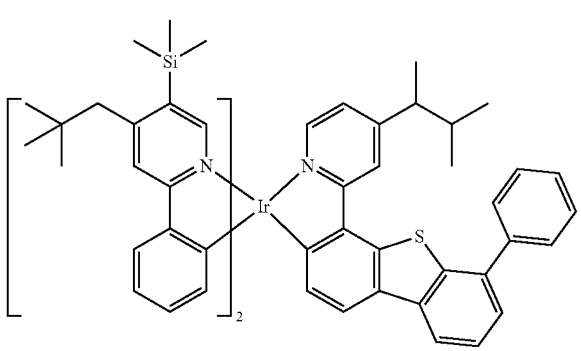
-continued
868
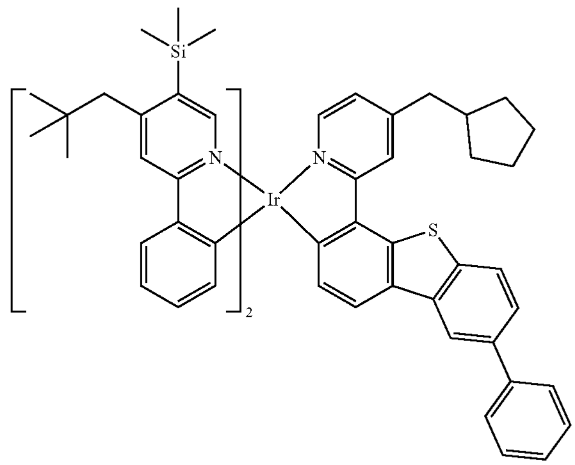
869
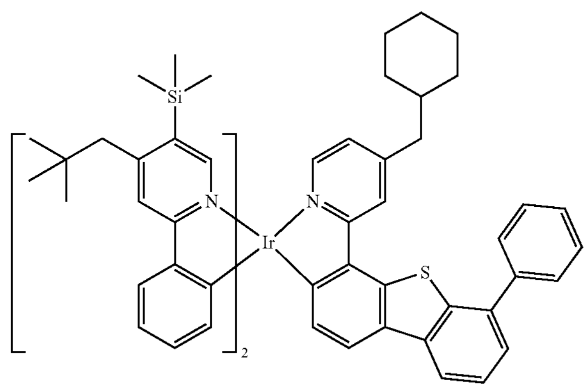
870
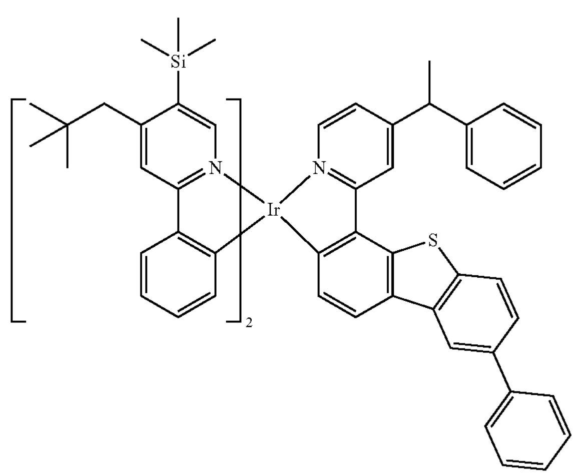

-continued
871
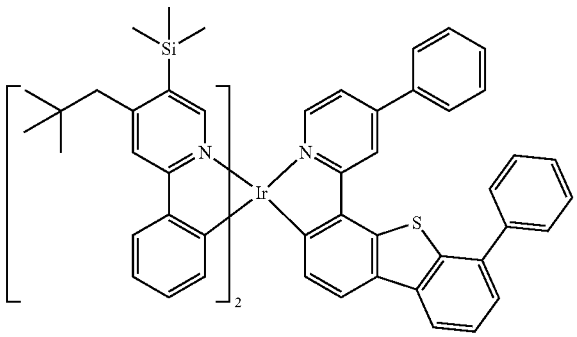
872
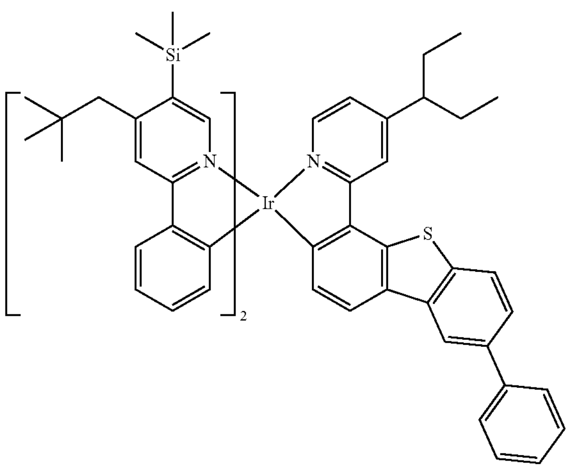
873
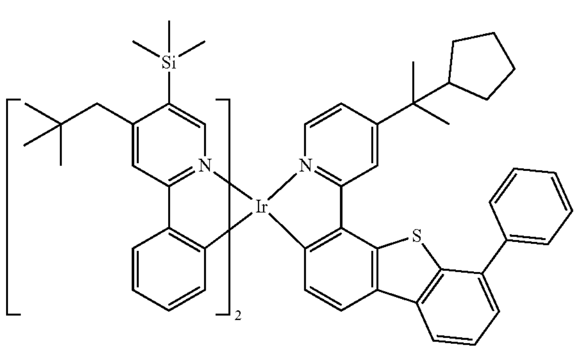
-continued
874
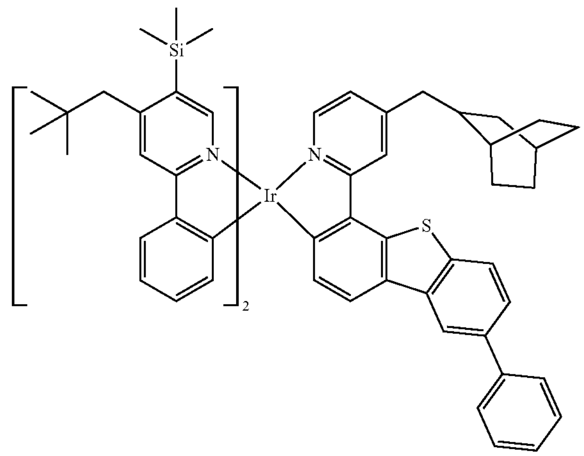
875
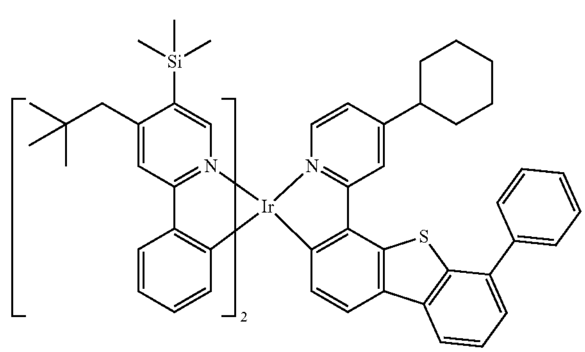
876
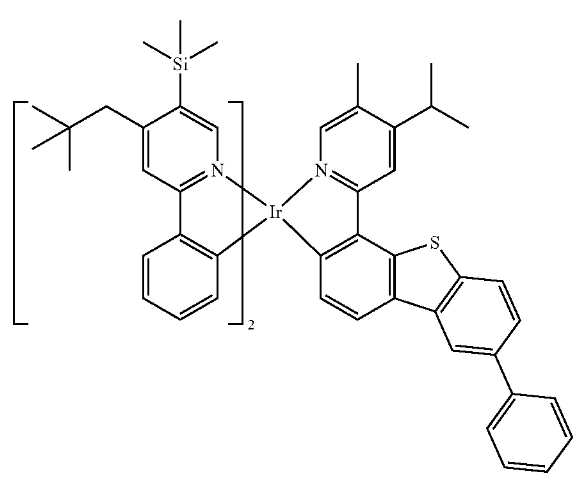

-continued
877
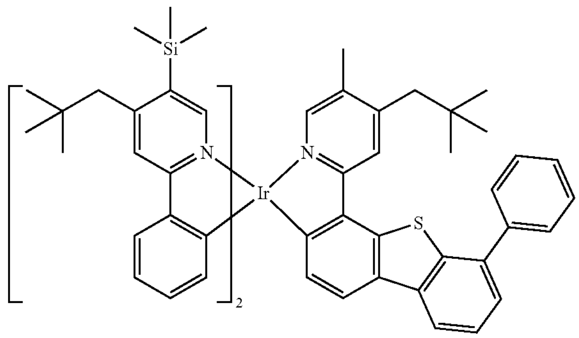
878
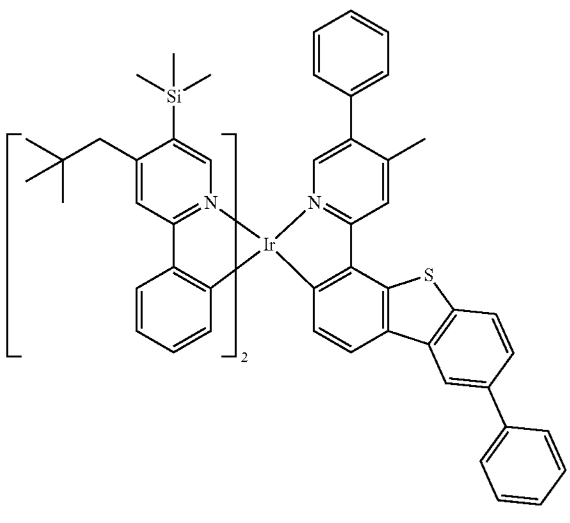
879
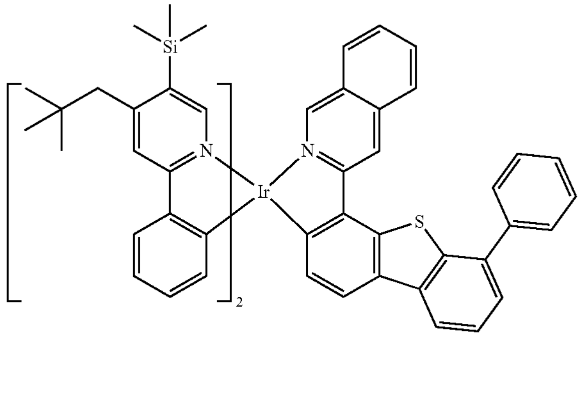
-continued
880
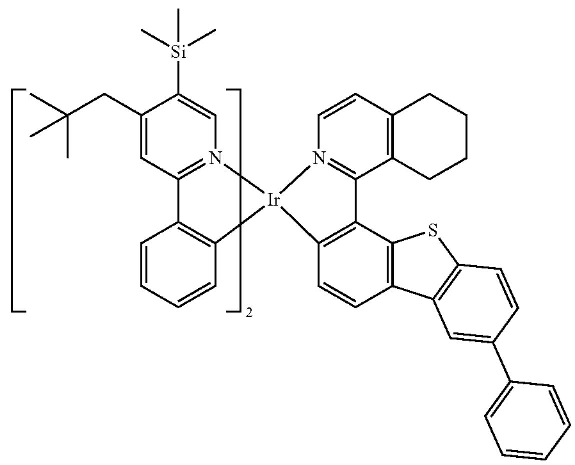
881
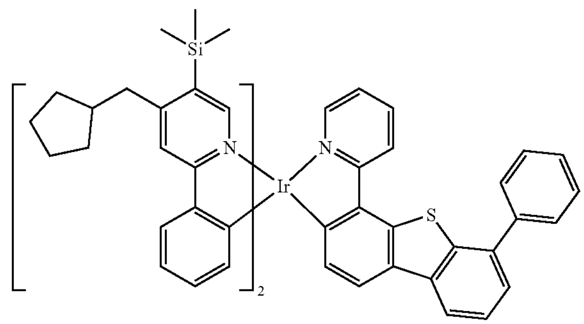
882
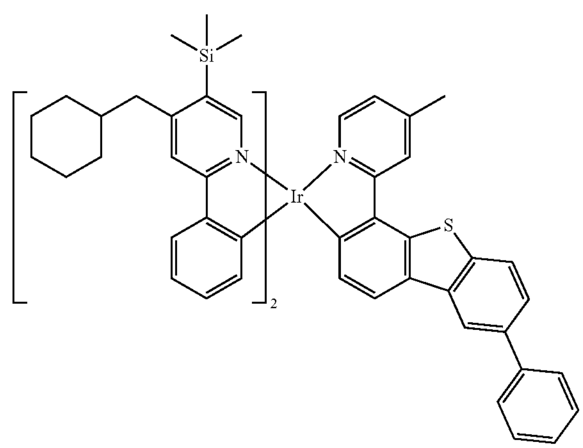
883
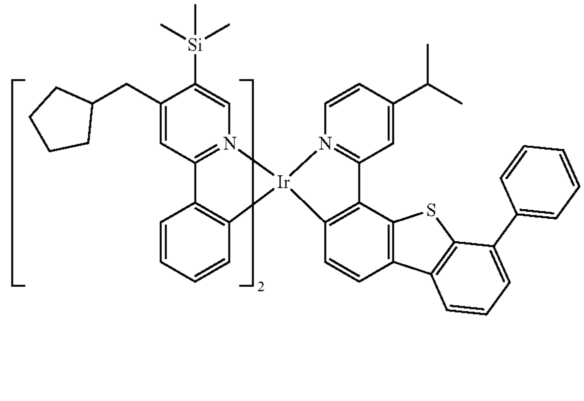

-continued
884
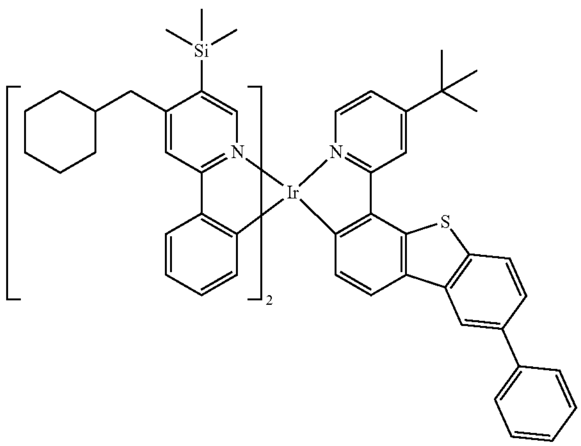
885
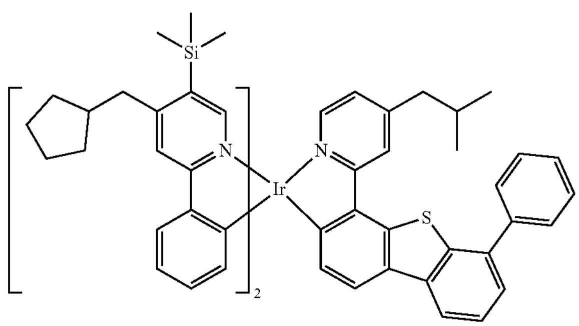
886
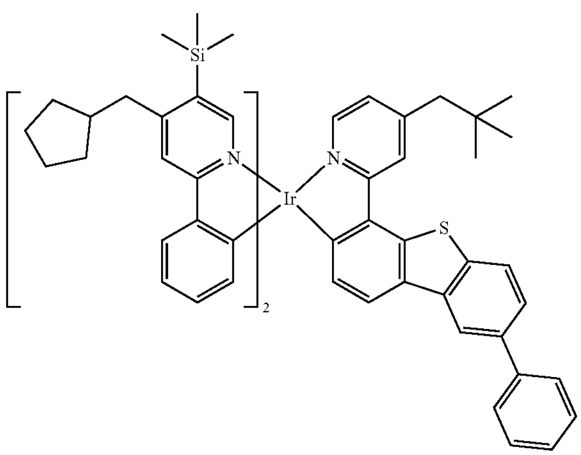
887
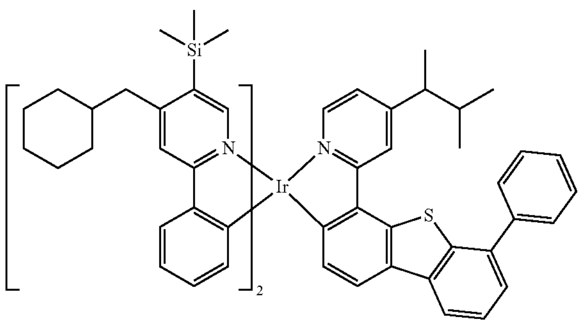
-continued
888
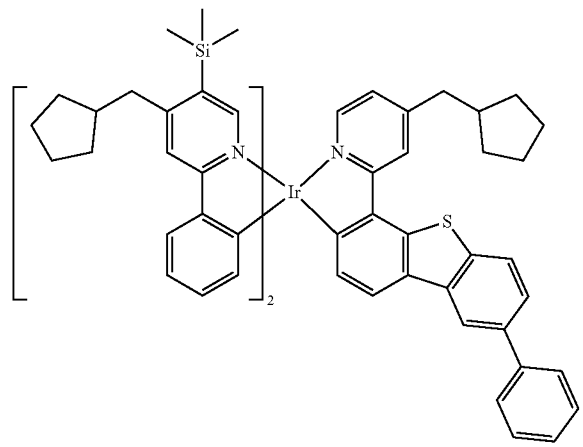
889
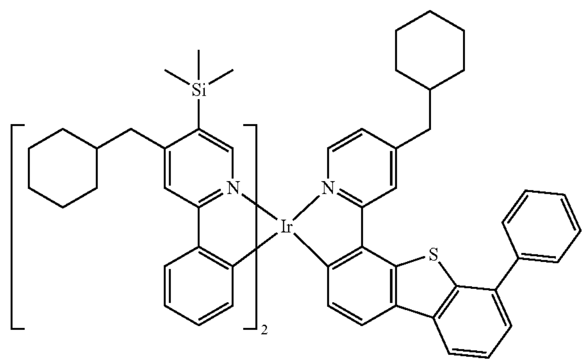
890
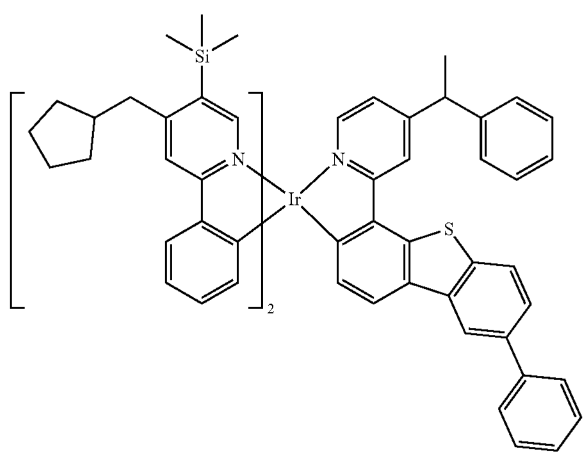
891
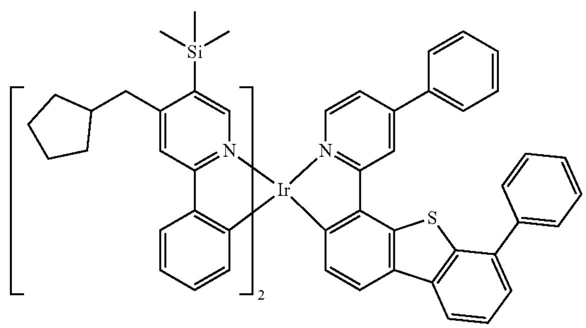

-continued
892
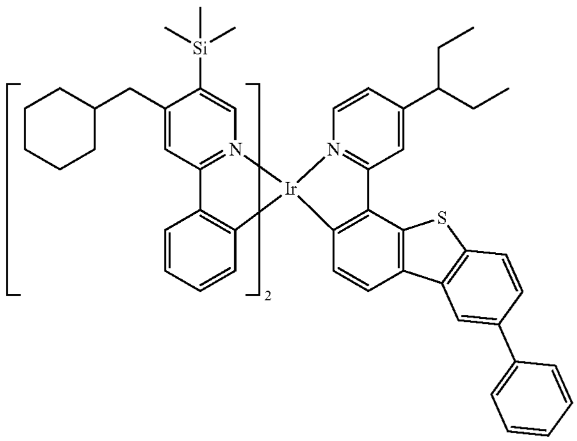
893
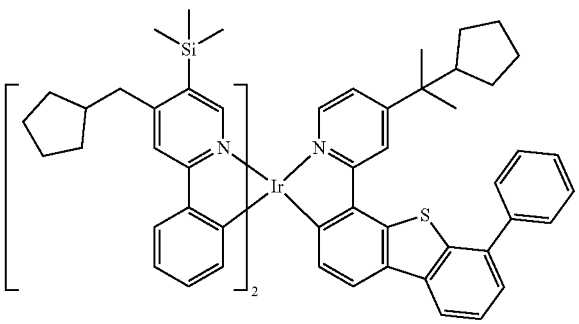
894
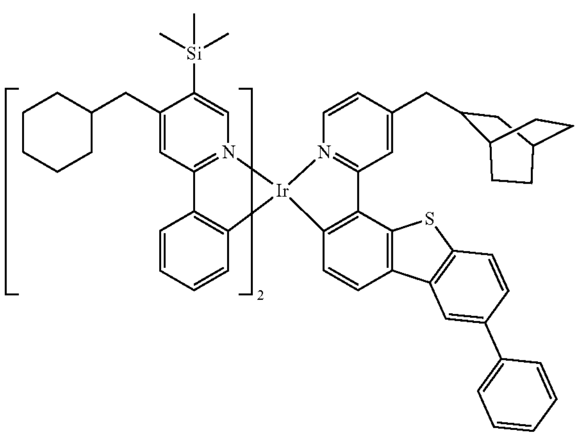
895
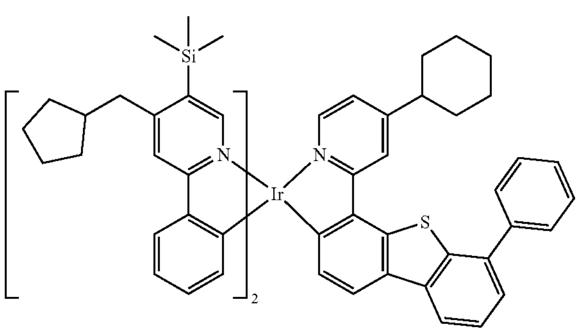
-continued
896
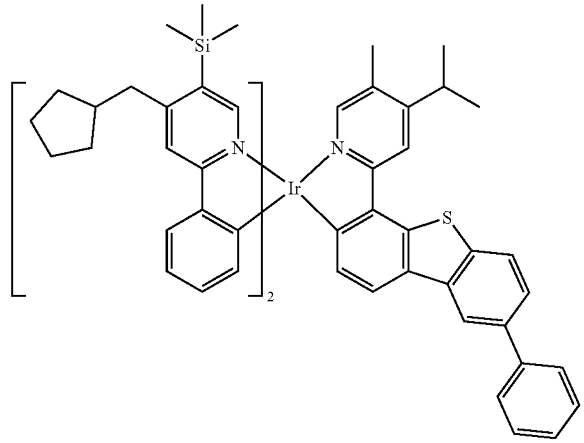
897
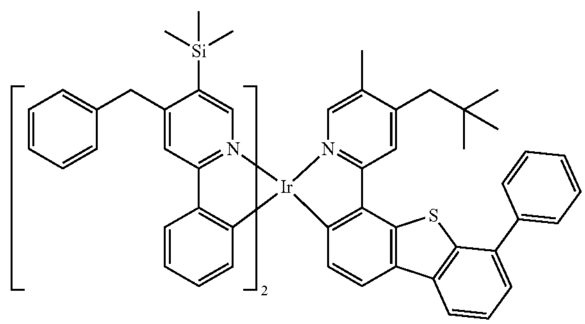
898
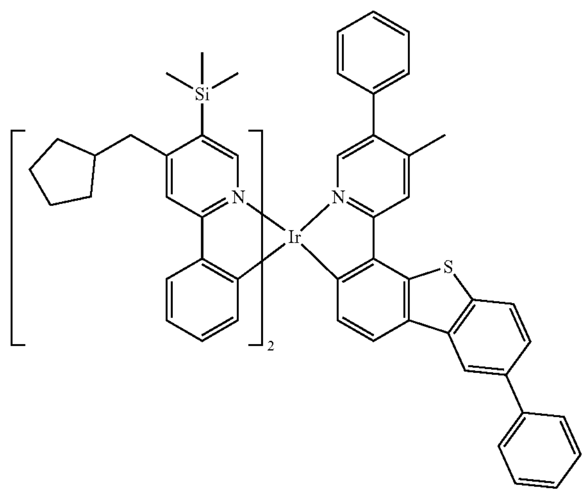
899
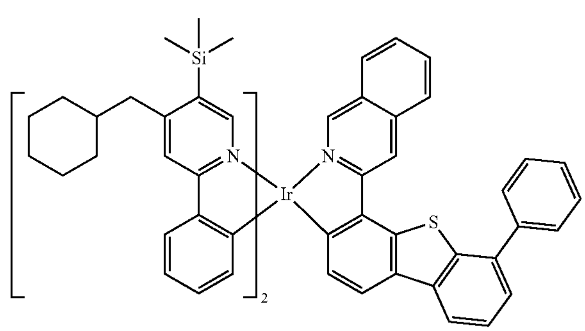

-continued
900
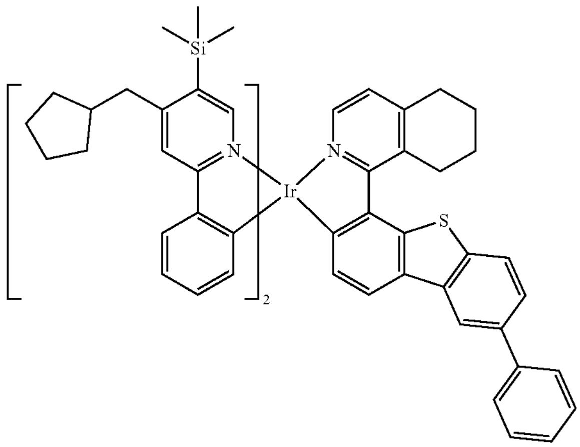
901
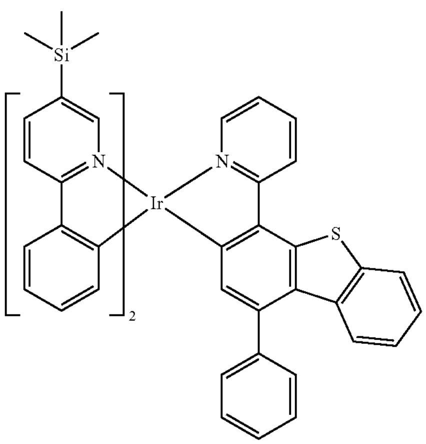
902
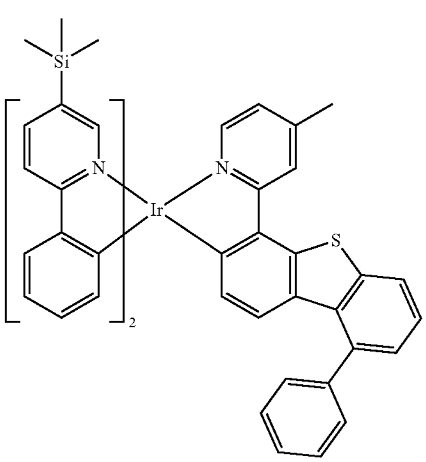
-continued
903
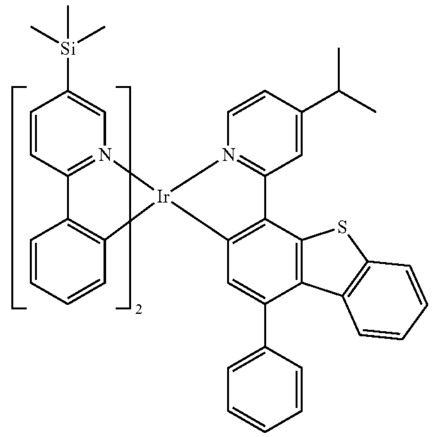
904
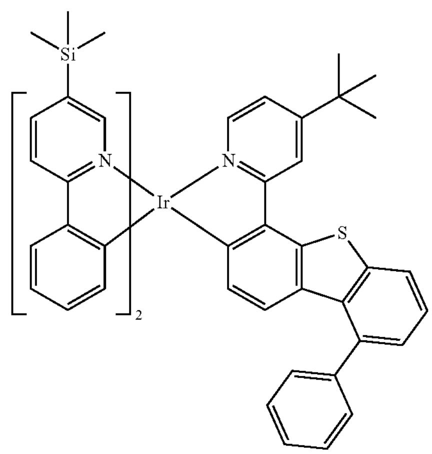
905
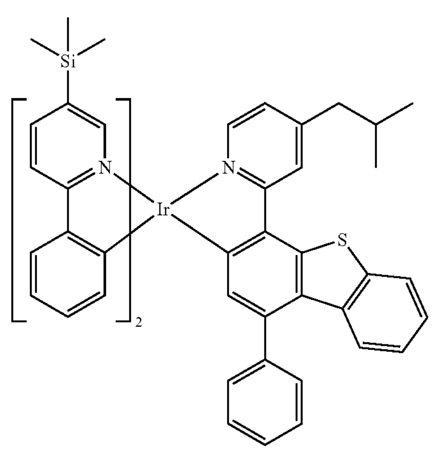

-continued
906
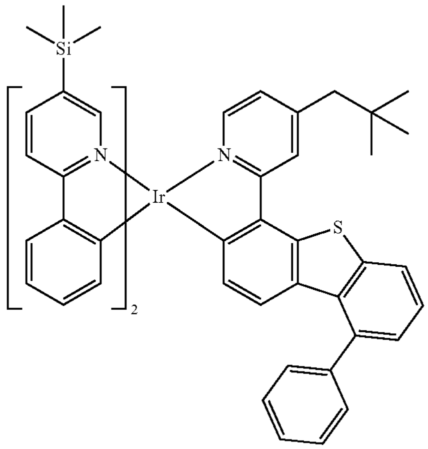
907
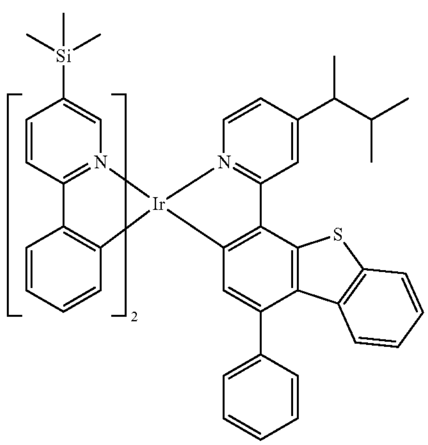
908
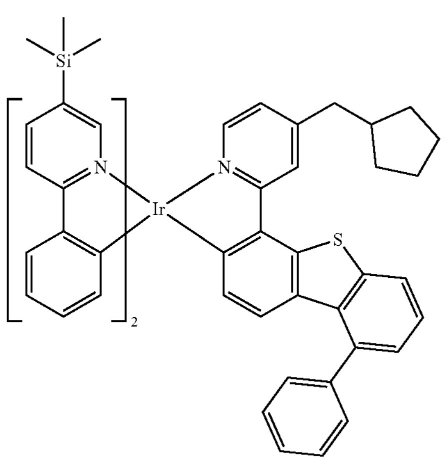
-continued
909
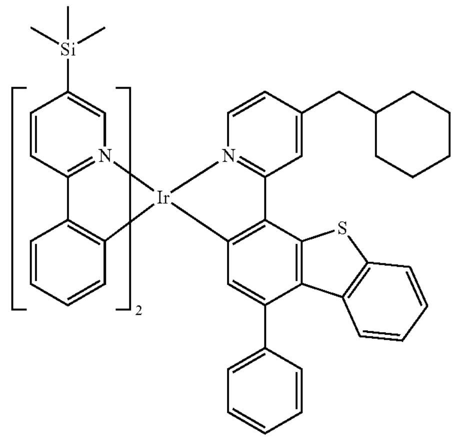
910
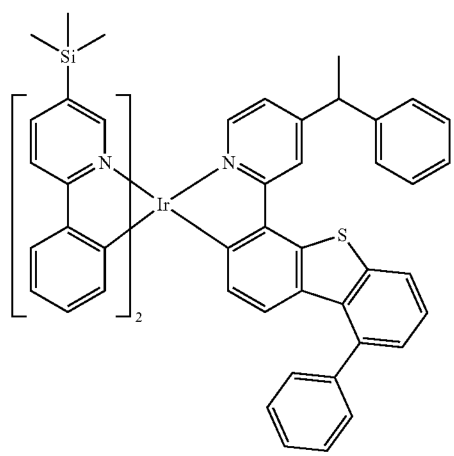
911
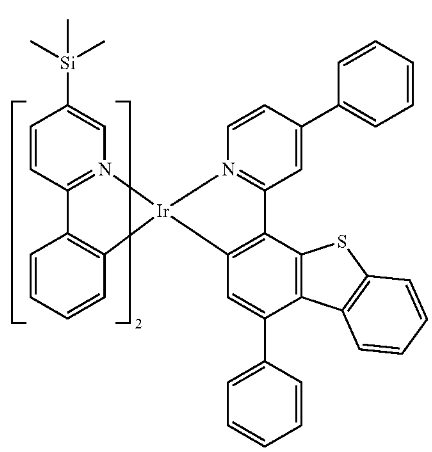

-continued
912
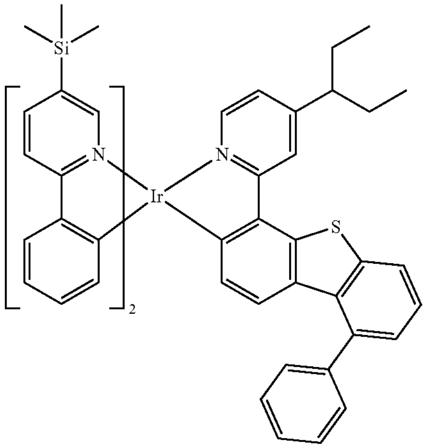
913
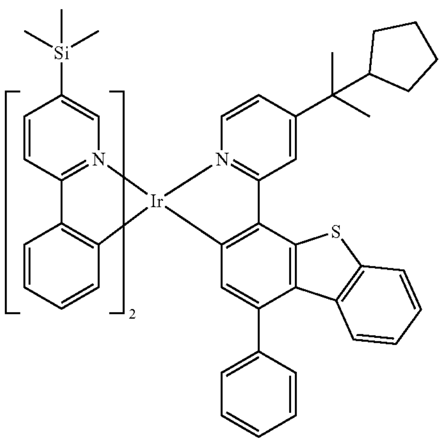
914
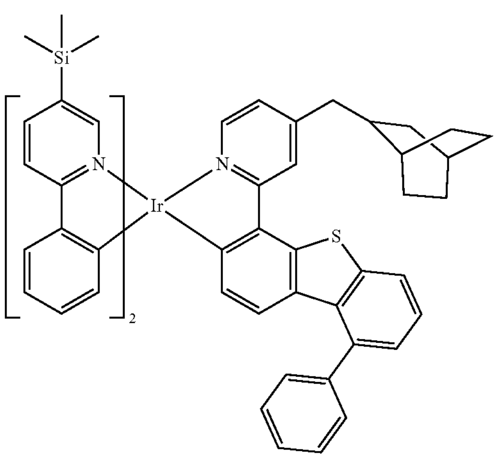
-continued
915
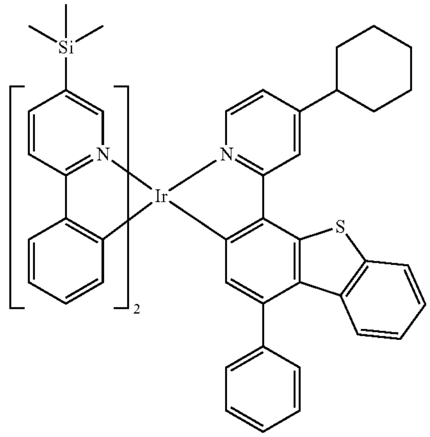
916
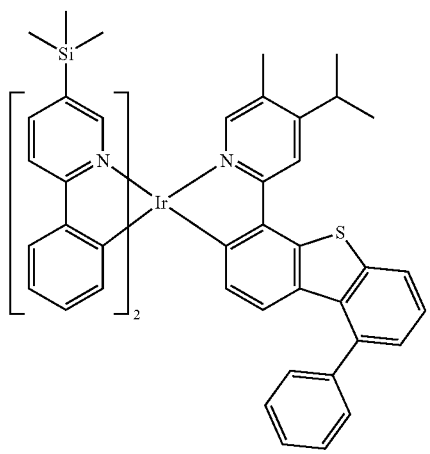
917
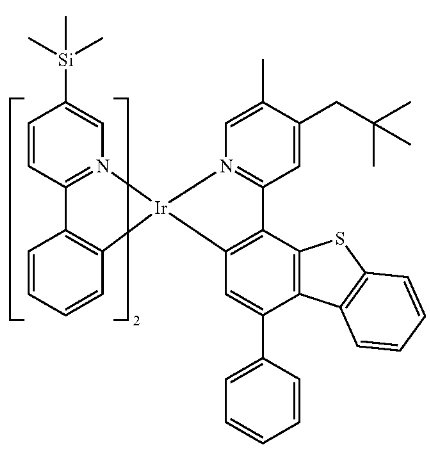

-continued
918
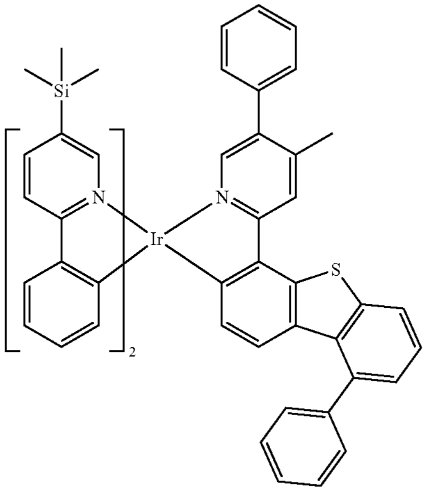
919
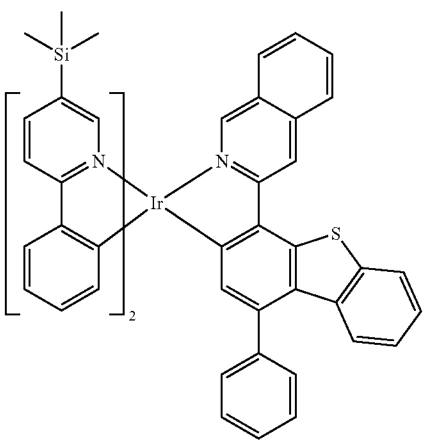
920
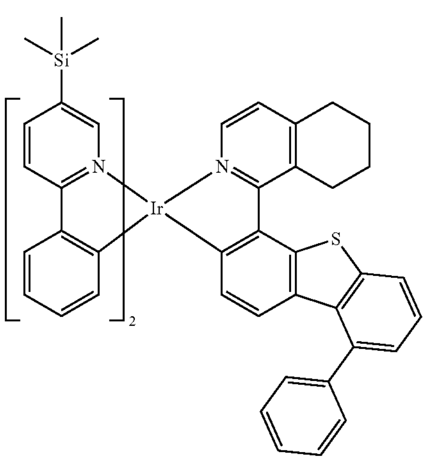
921
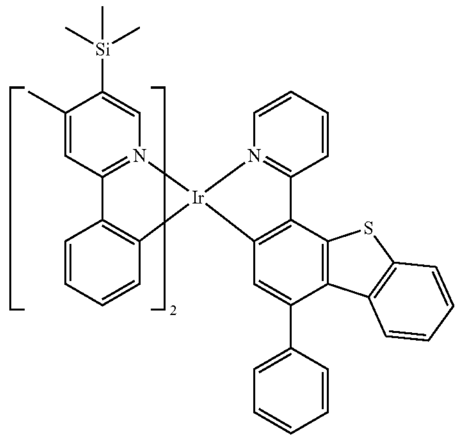
922
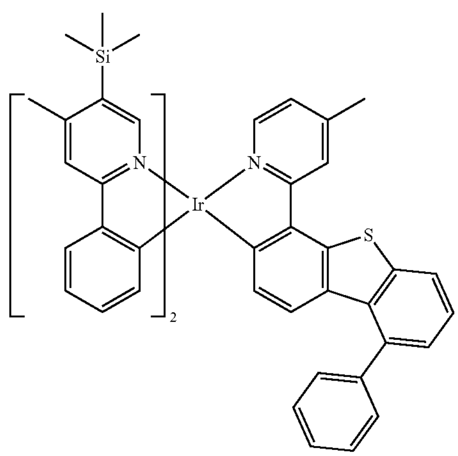
923
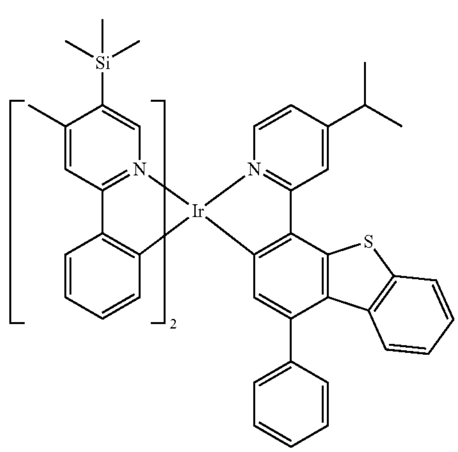

924
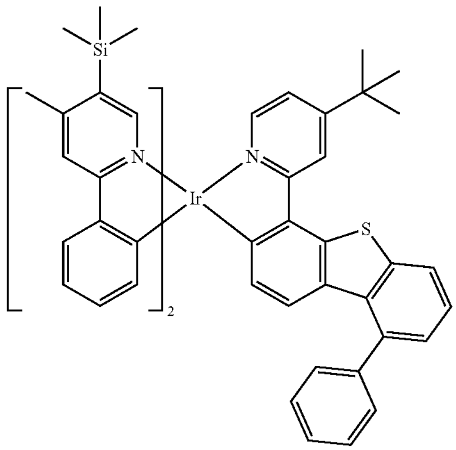
925
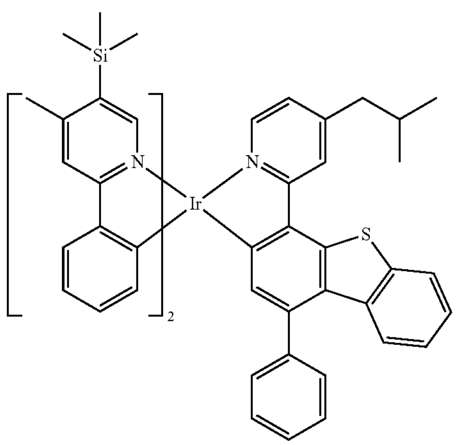
926
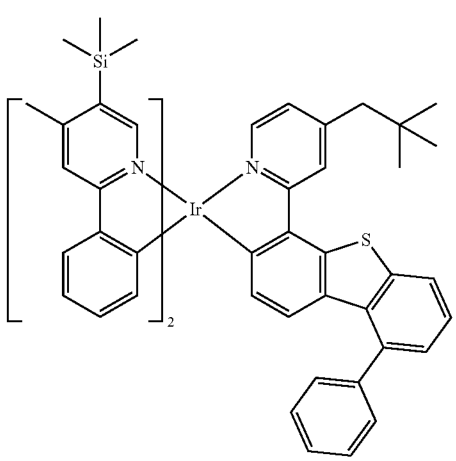
927
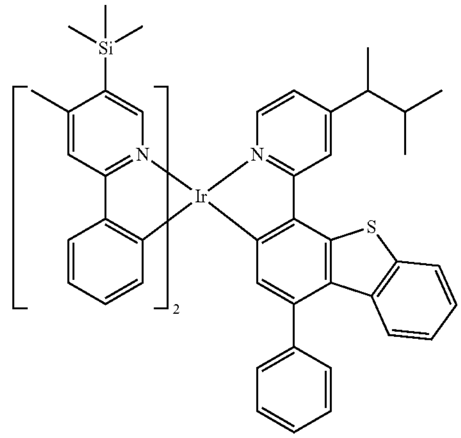
928
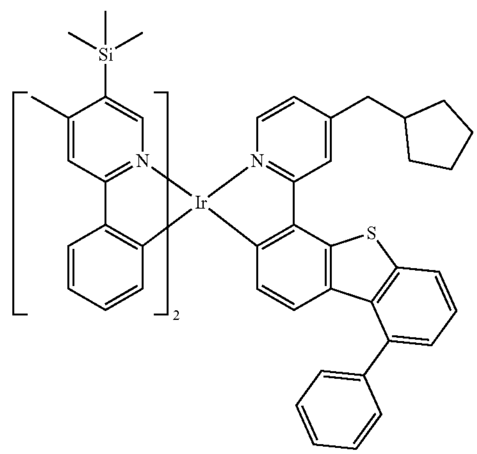
929
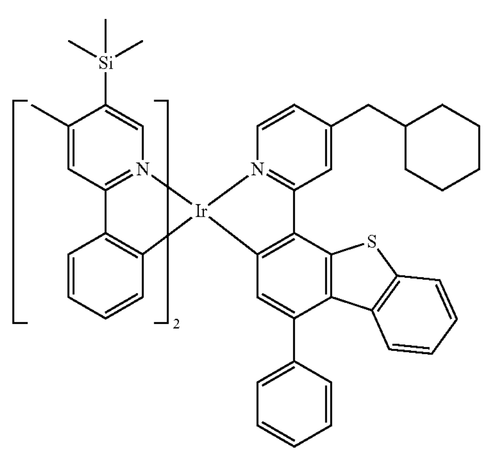

930
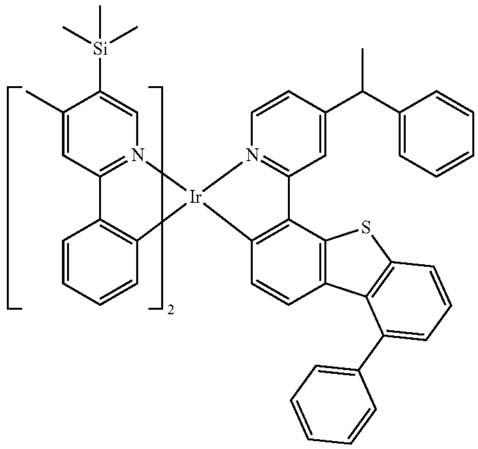
931
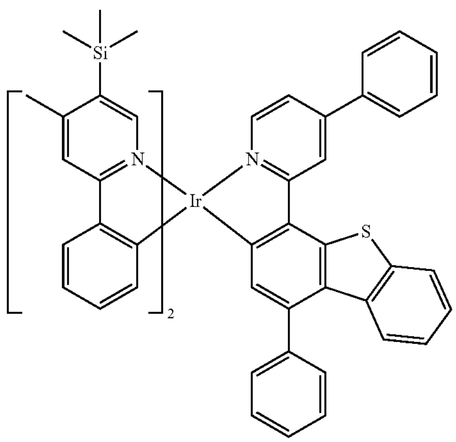
932
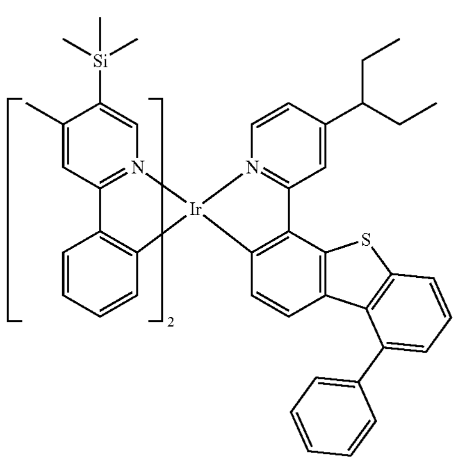
933
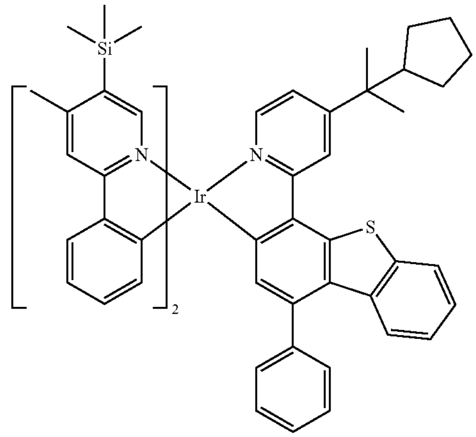
934
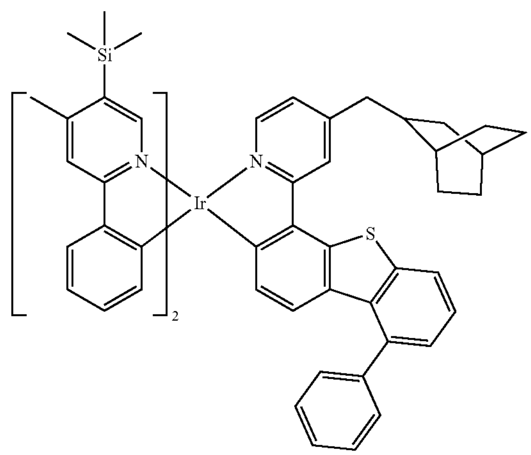
935
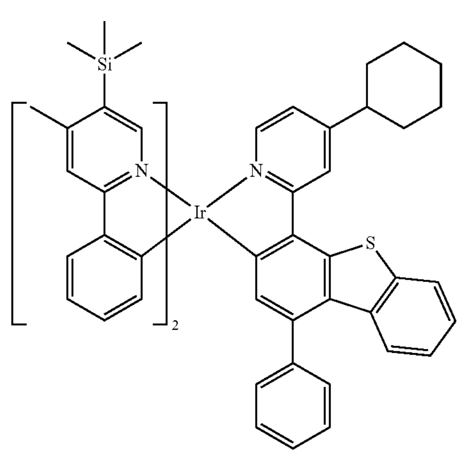

-continued
936
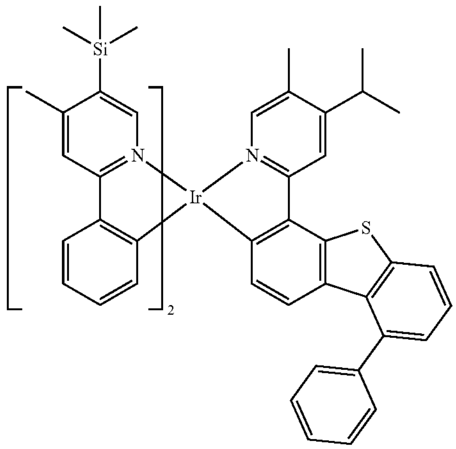
937
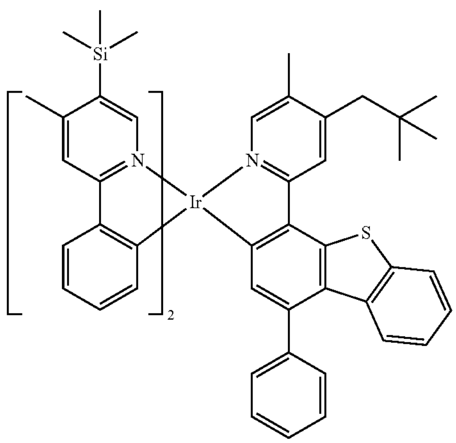
938
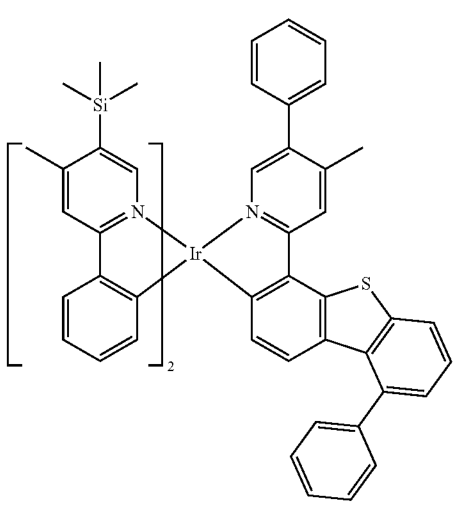
-continued
939
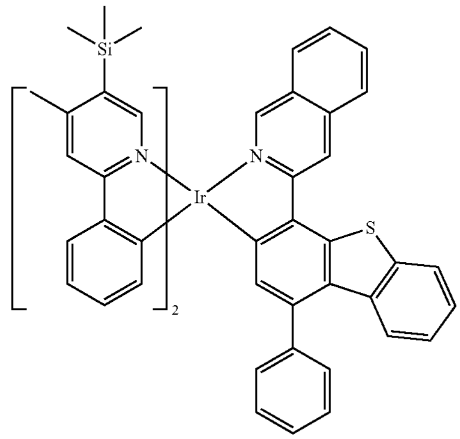
940
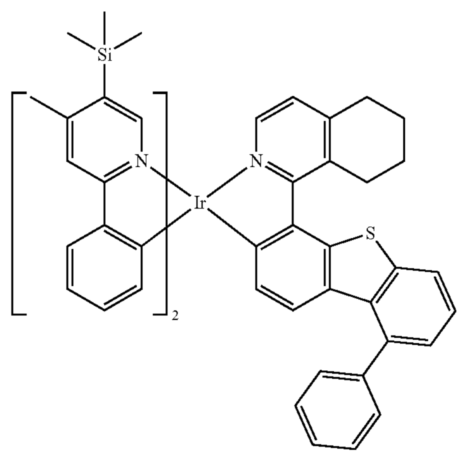
941
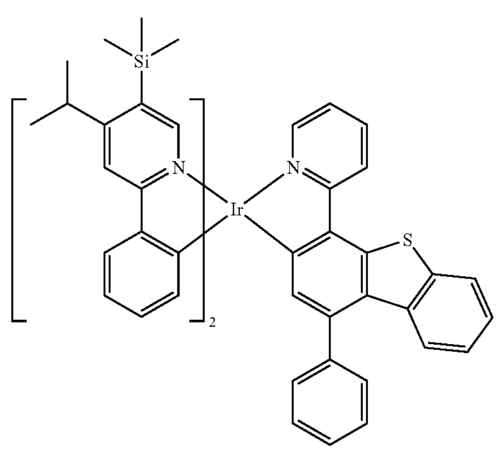

-continued
942
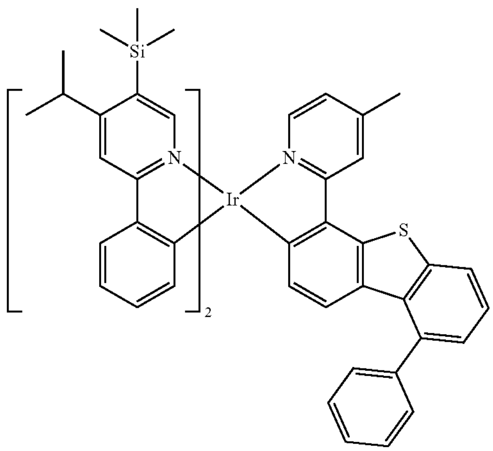
943
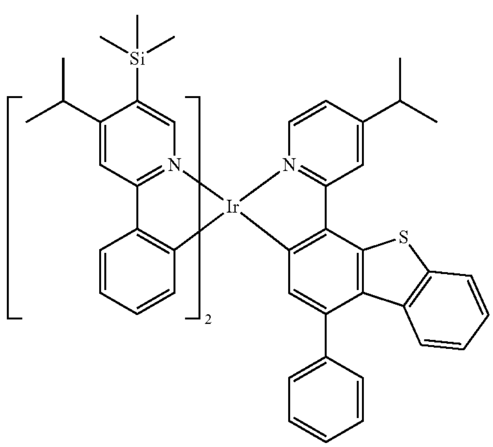
944
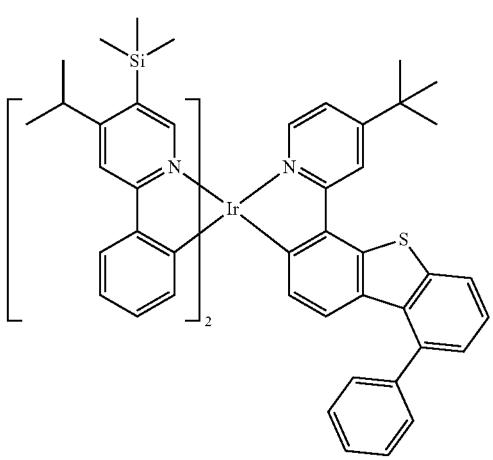
-continued
945
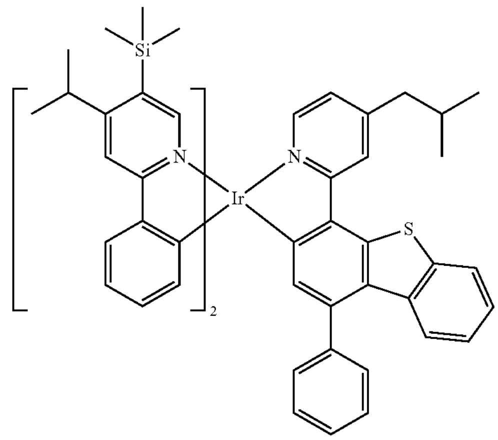
946
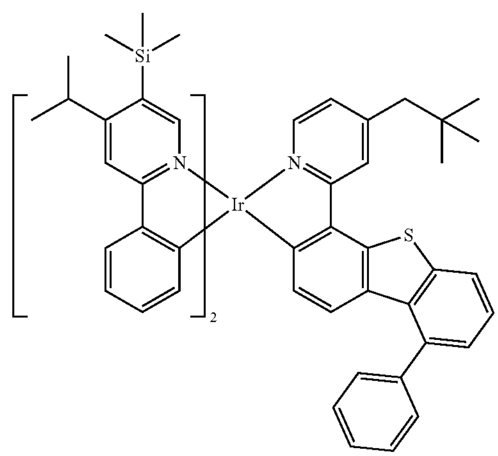
947
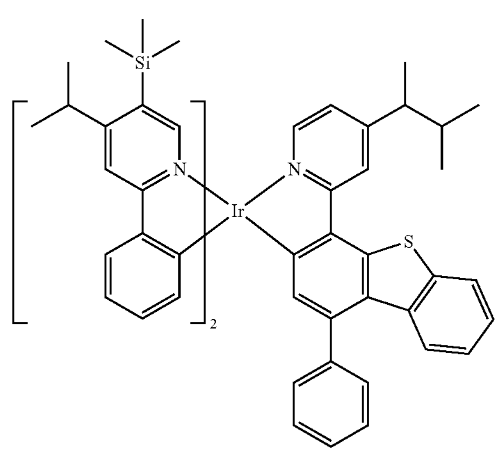

-continued
948
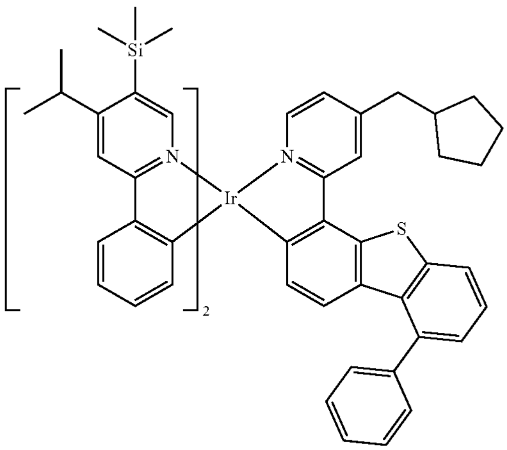
949
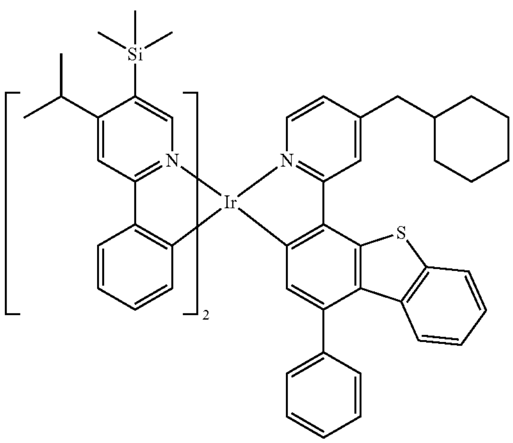
950
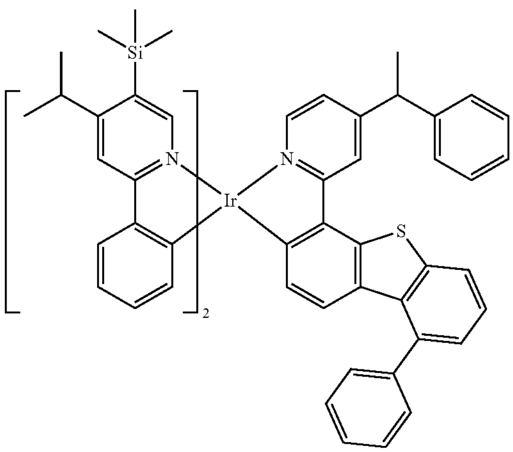
-continued
951
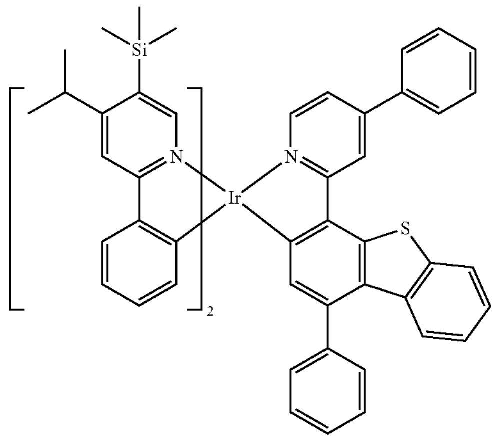
952
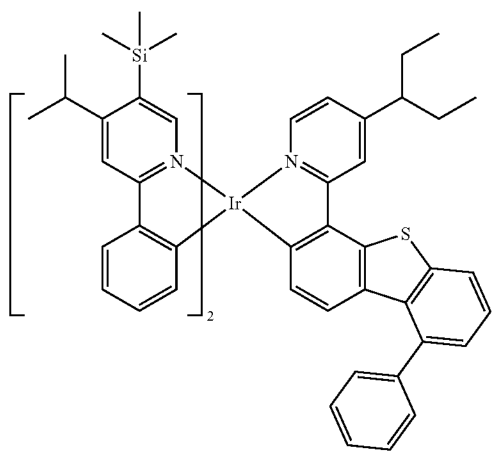
953
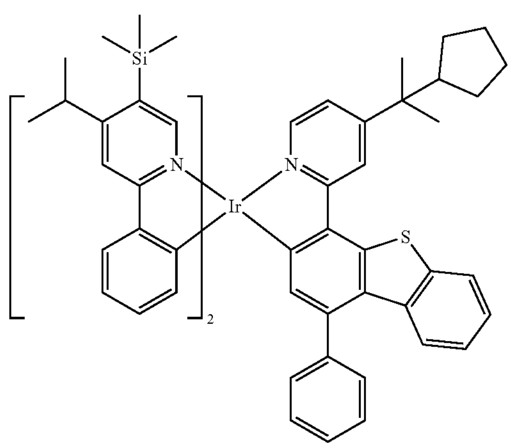

-continued
954
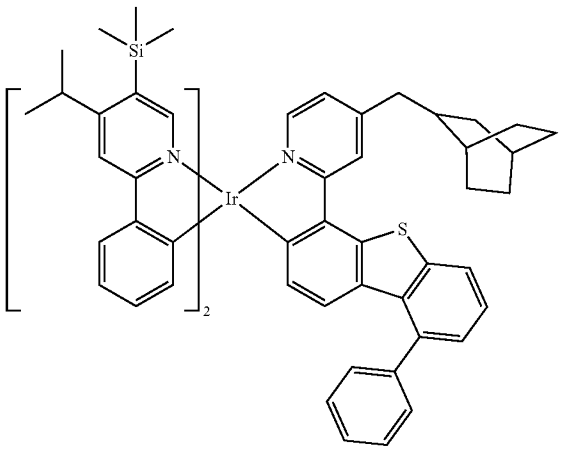
955
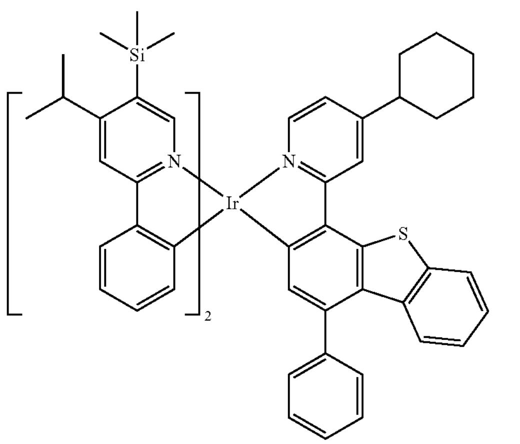
956
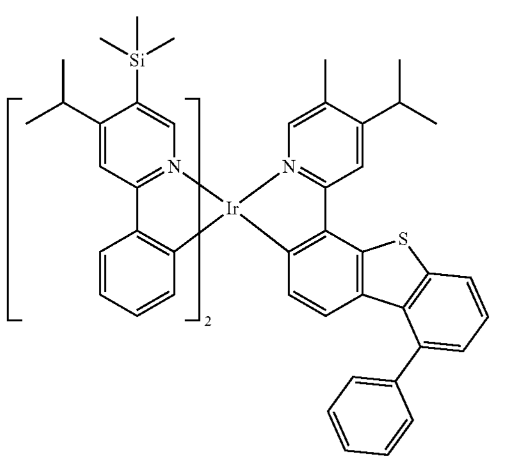
-continued
957
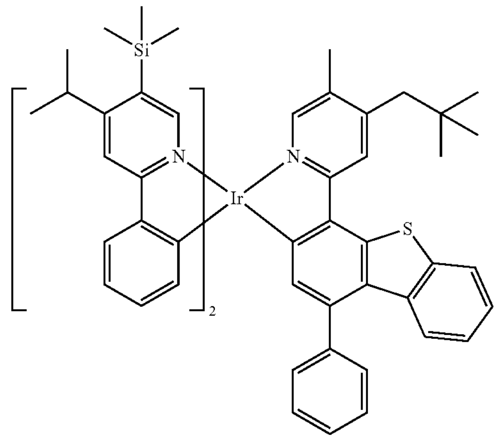
958
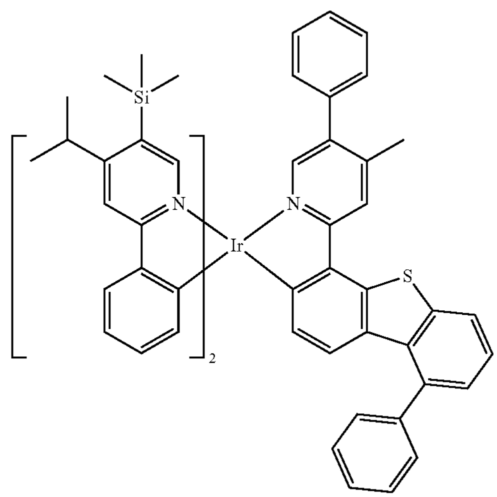
959
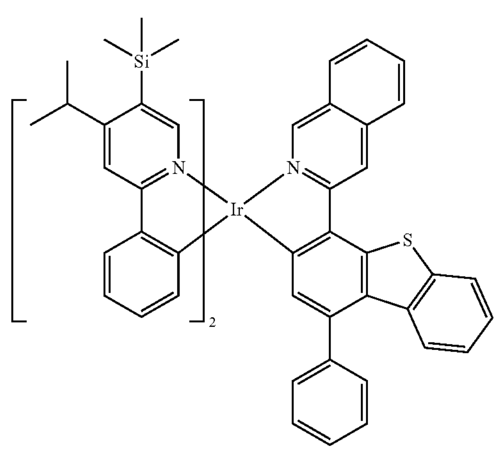

-continued
960
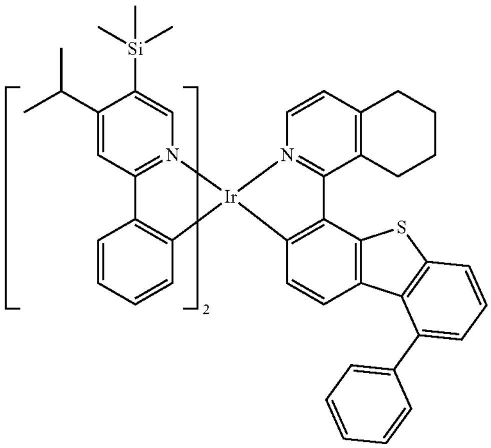
961
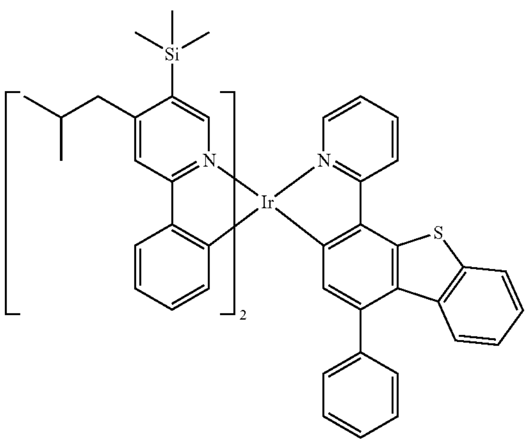
962
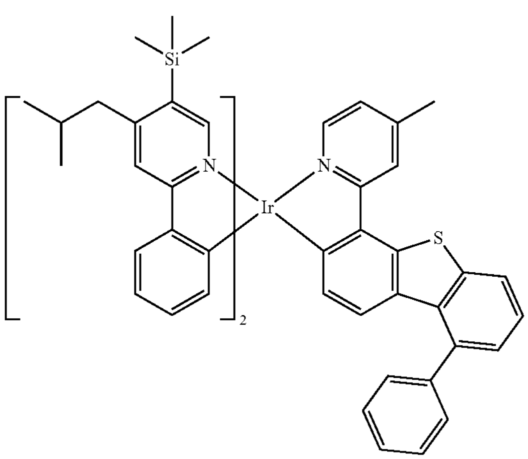
-continued
963
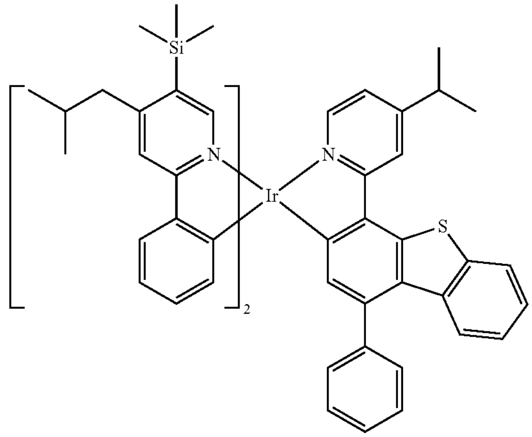
964
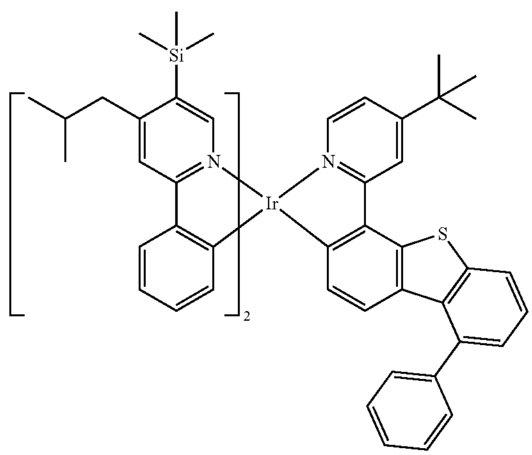
965
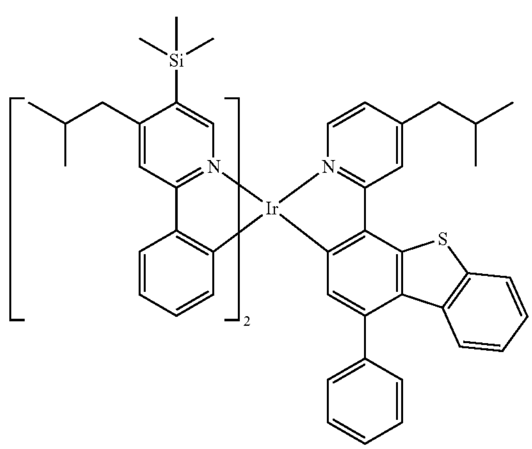

-continued
966
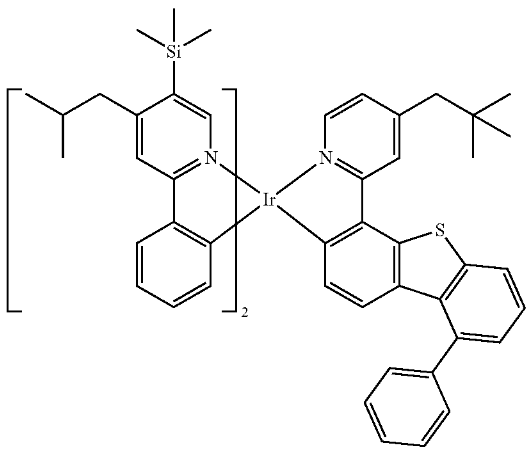
967
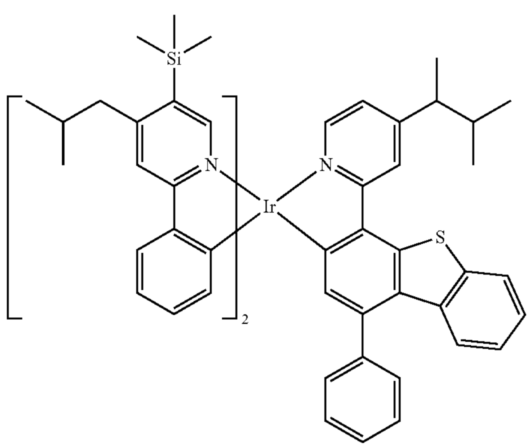
968
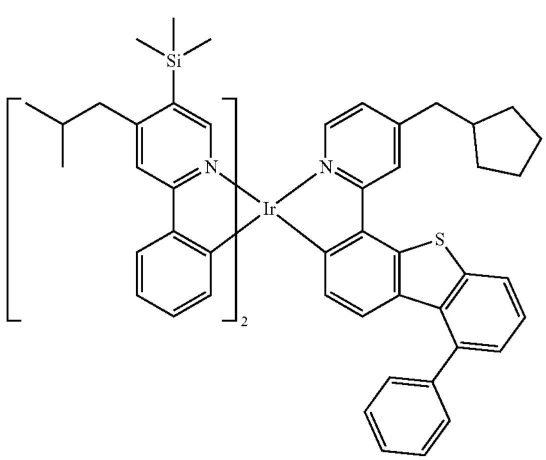
-continued
969
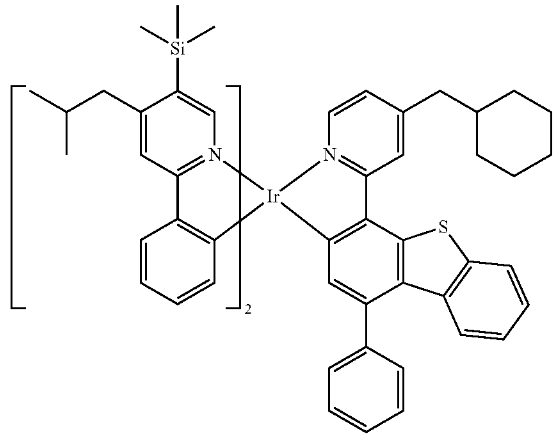
970
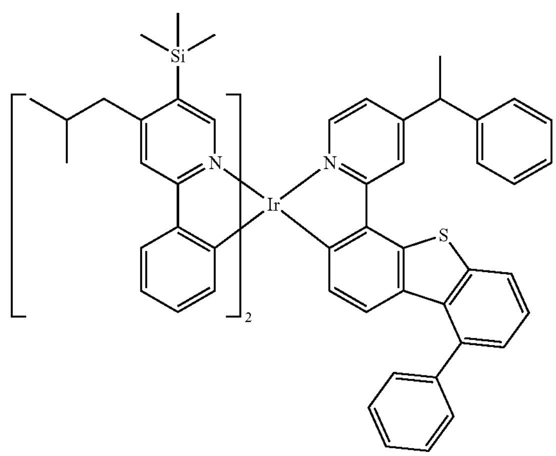
971
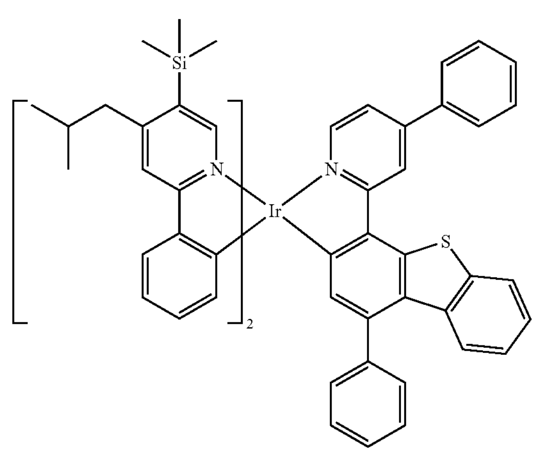

-continued
972
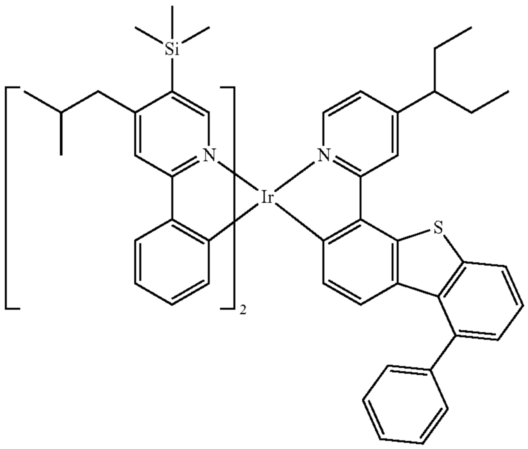
973
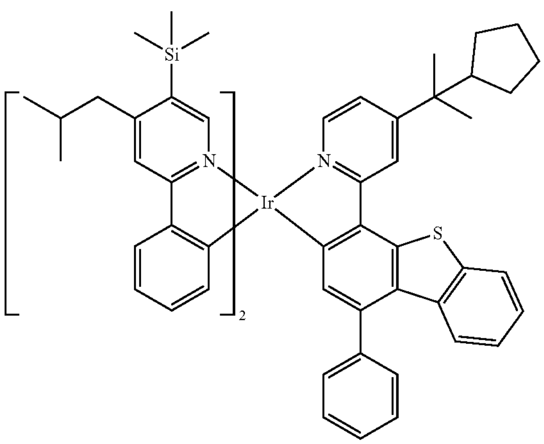
974
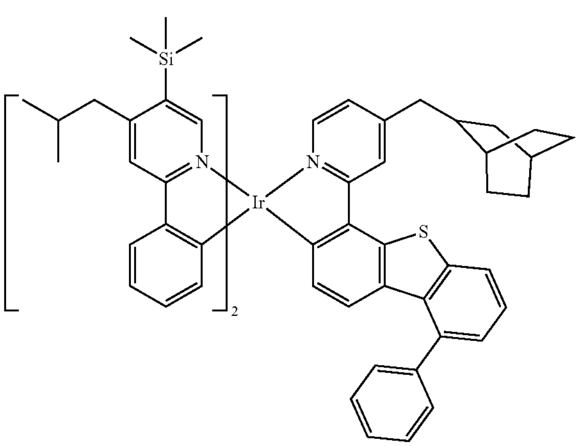
-continued
975
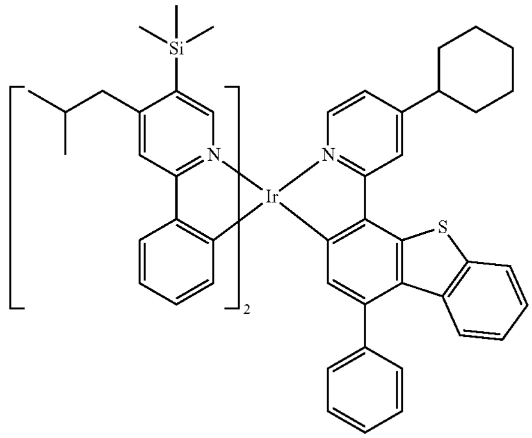
976
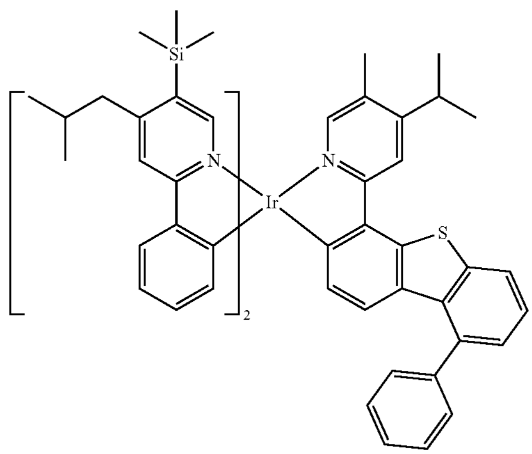
977
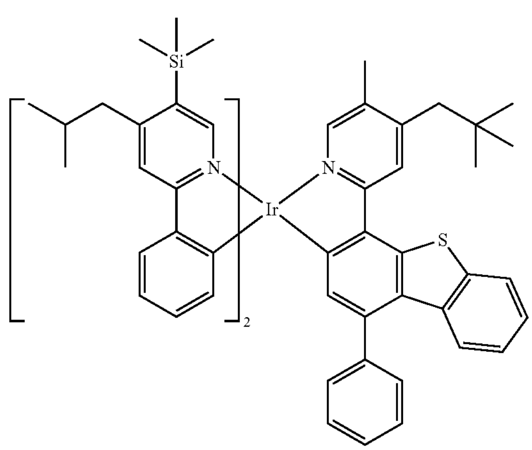

978
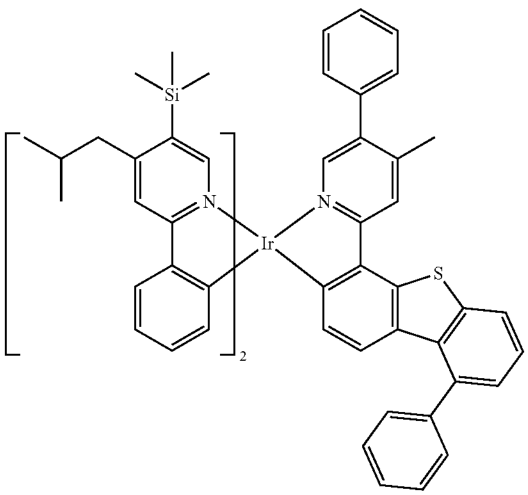
979
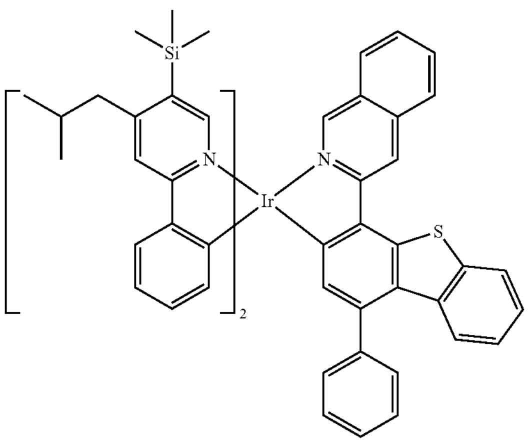
980
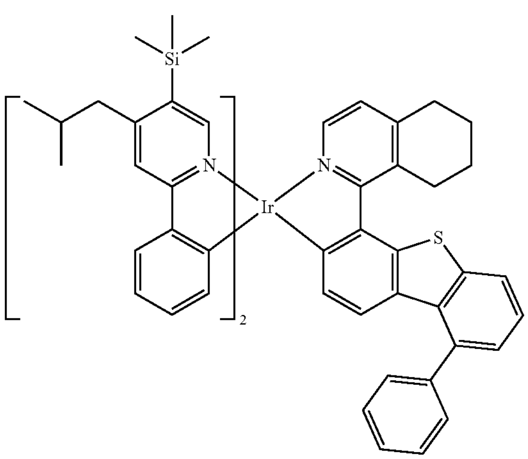
981
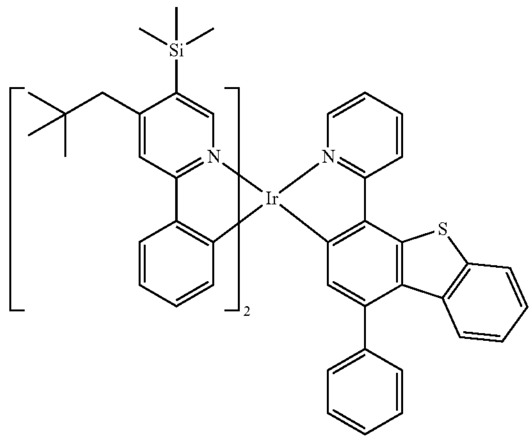
982
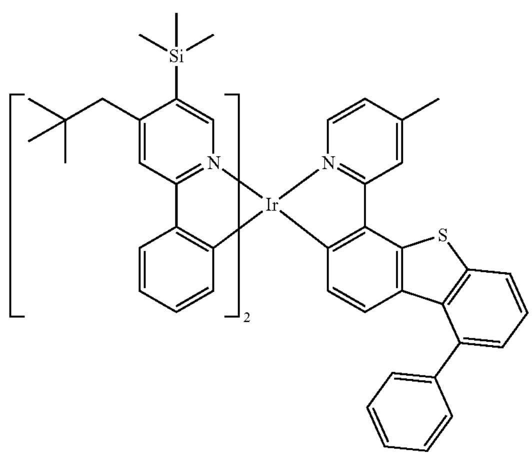
983
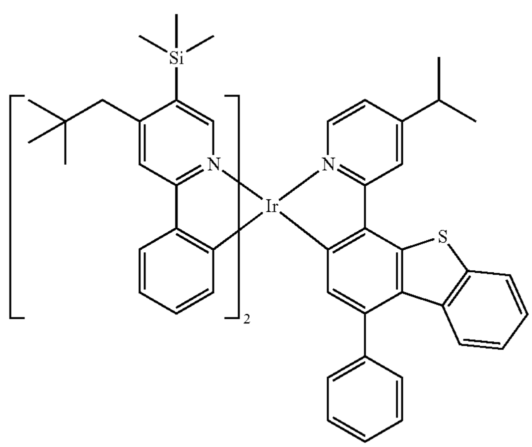

984
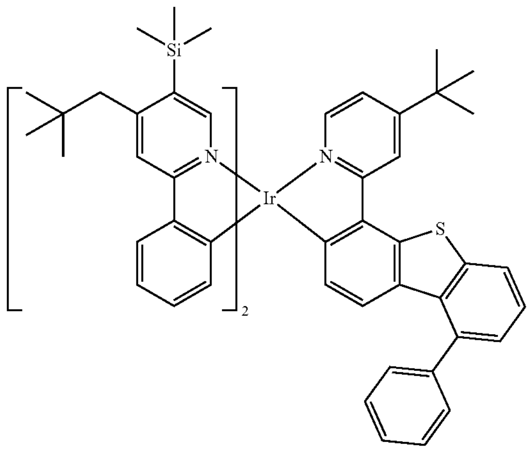
985
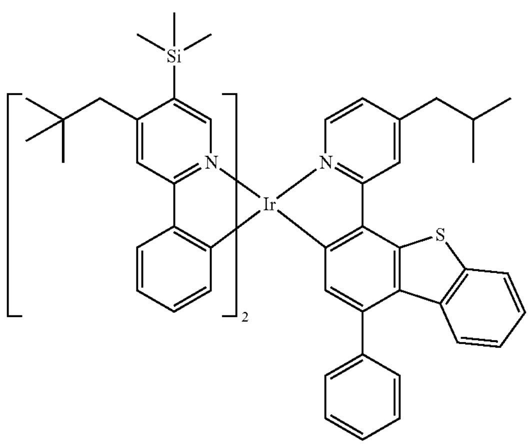
986
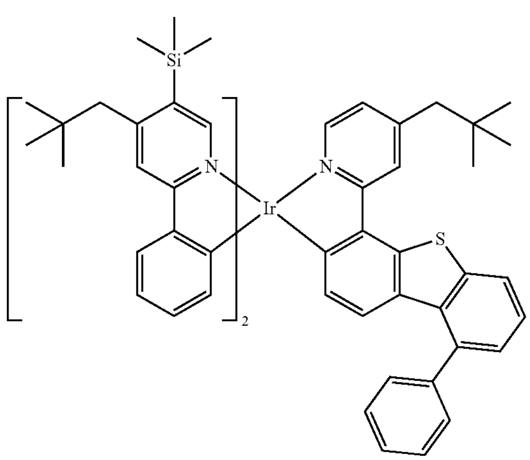
987
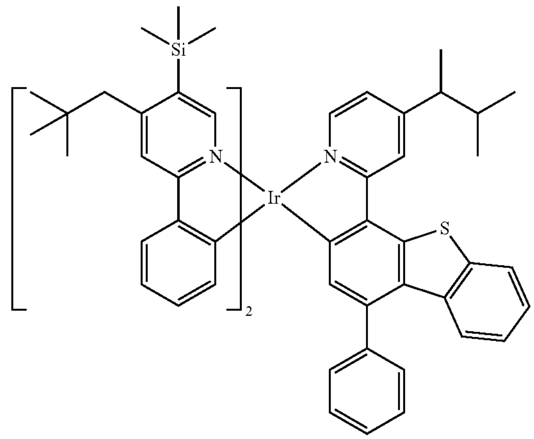
988
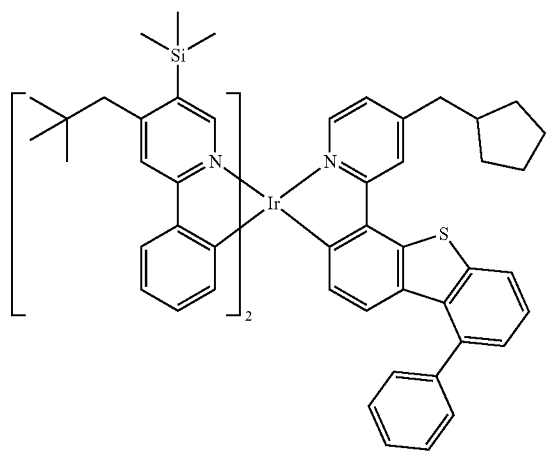
989
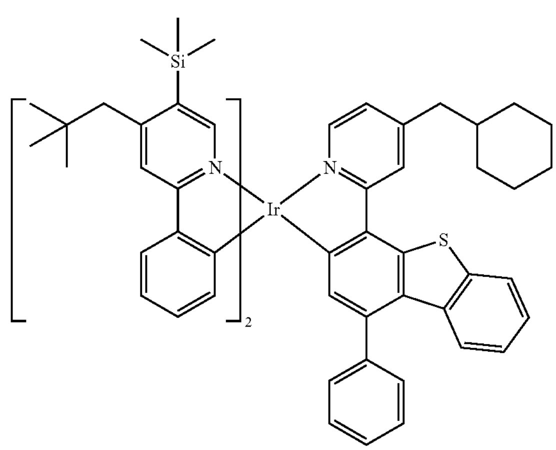

-continued
990
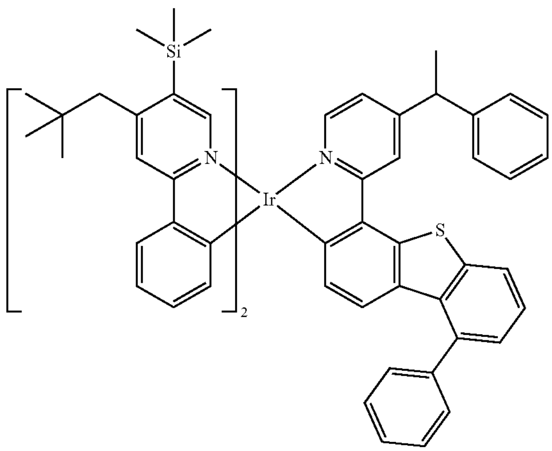
991
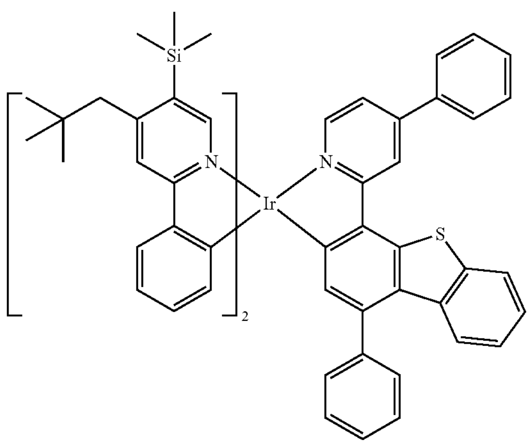
992
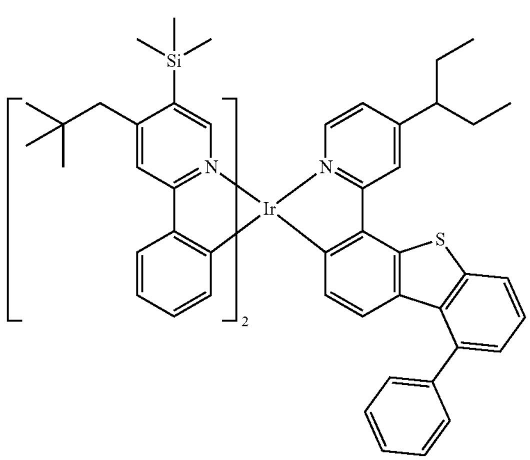
-continued
993
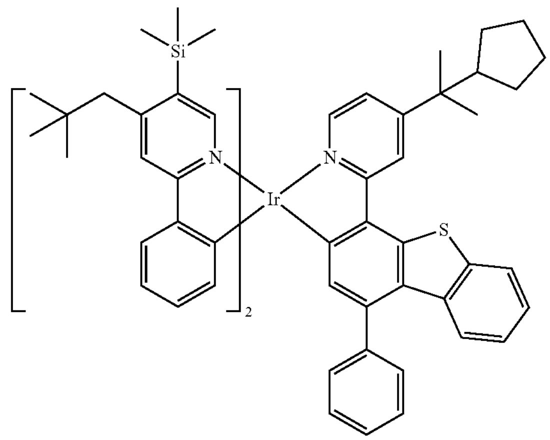
994
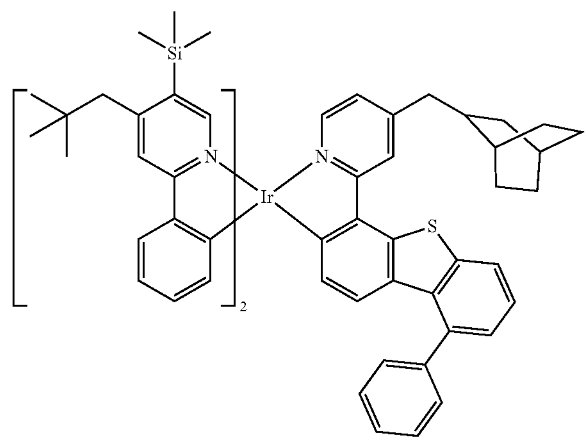
995
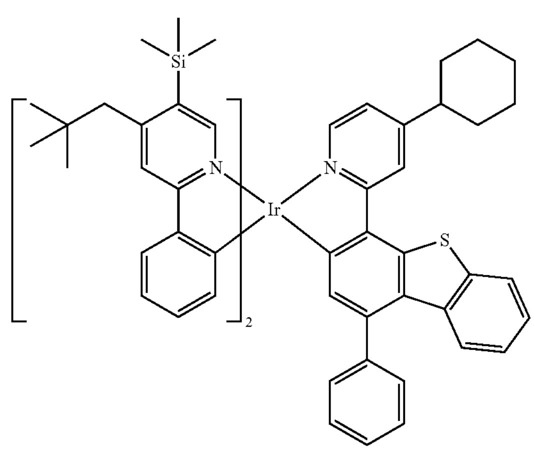

996
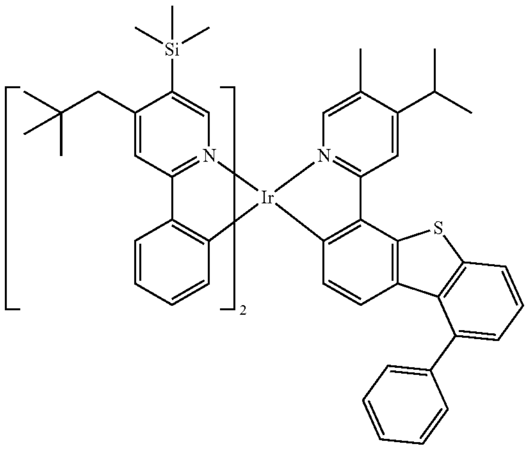
997
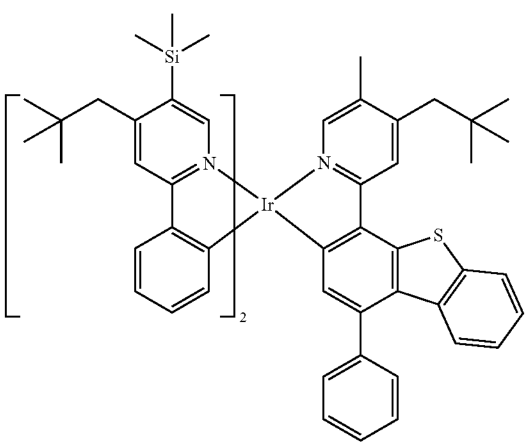
998
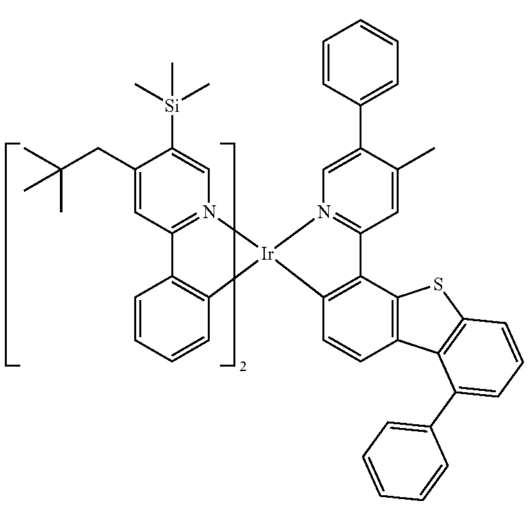
999
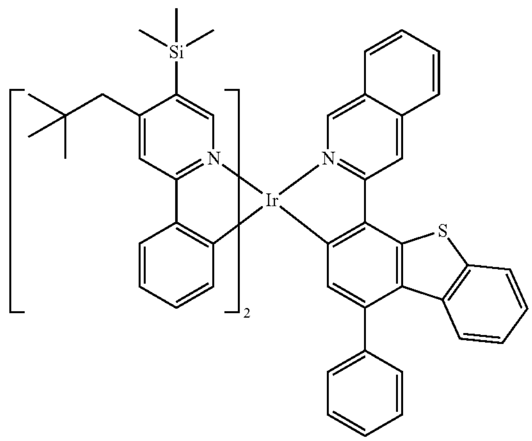
1000
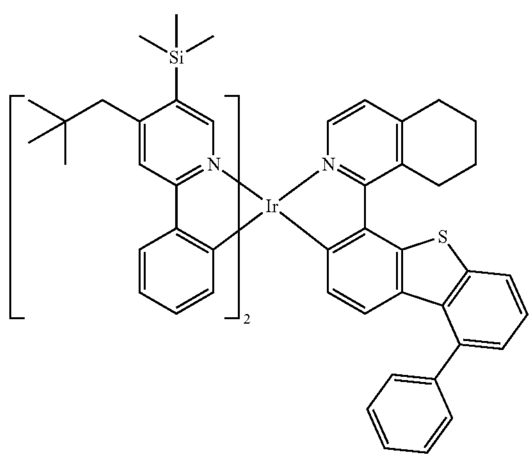
1001
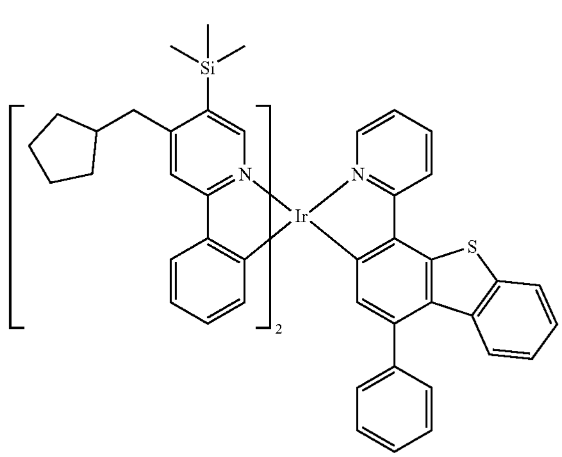

-continued
1002
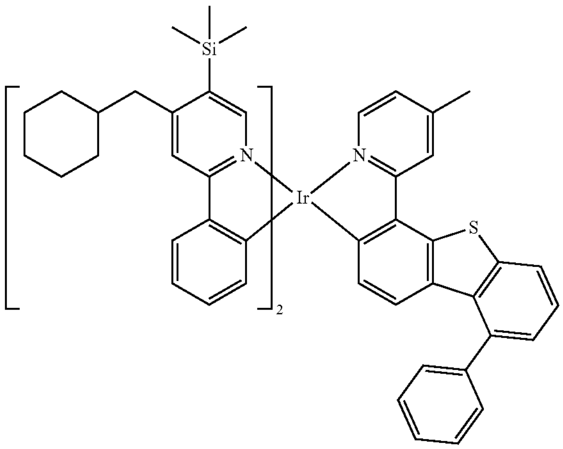
1003
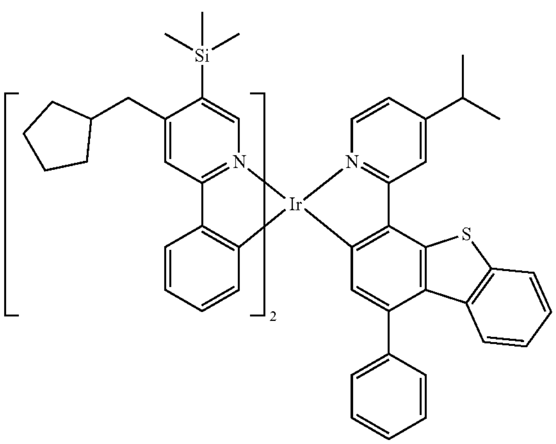
1004
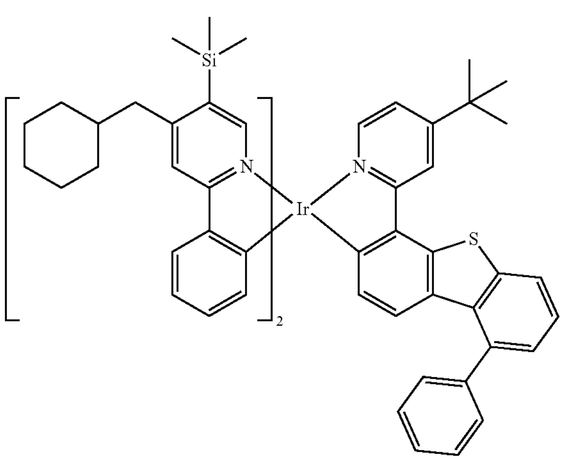
-continued
1005
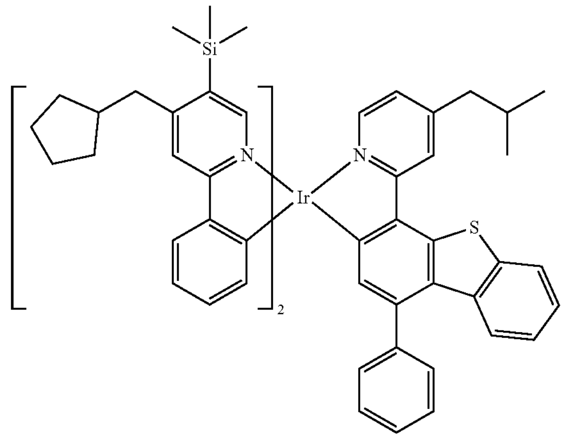
1006
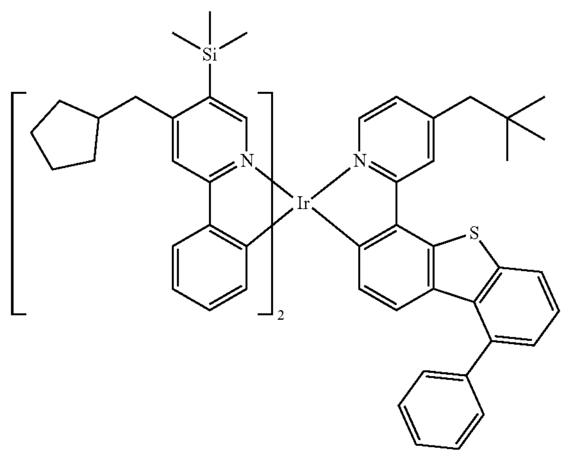
1007
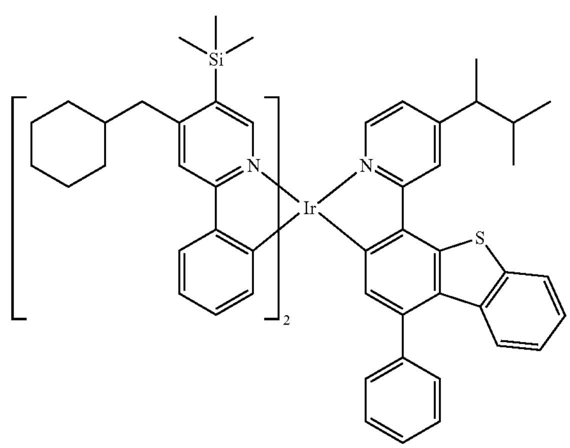

1008
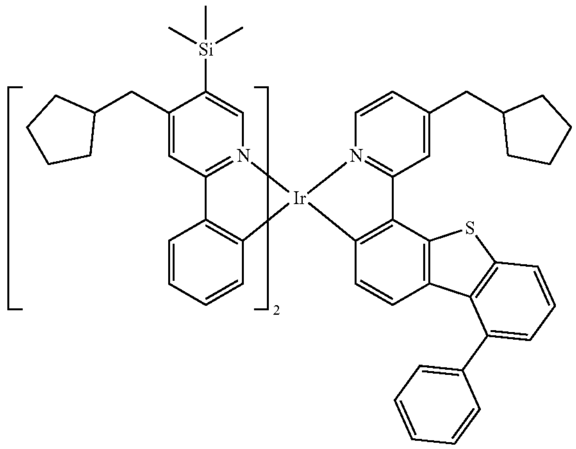
1009
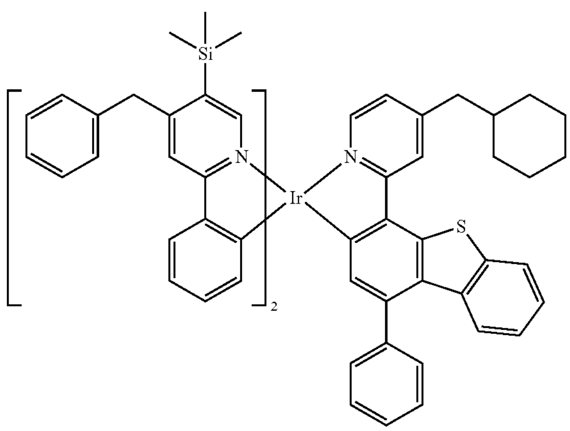
1010
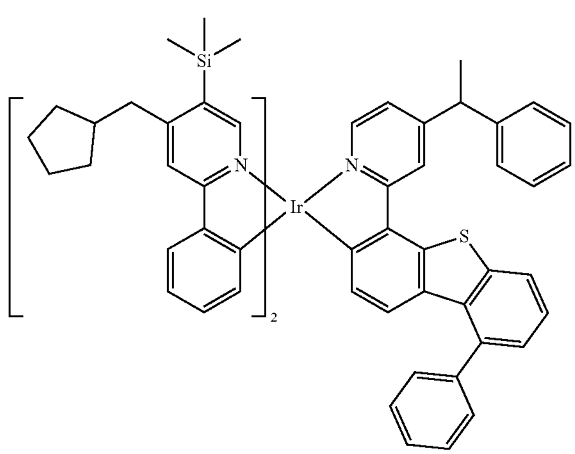
1011
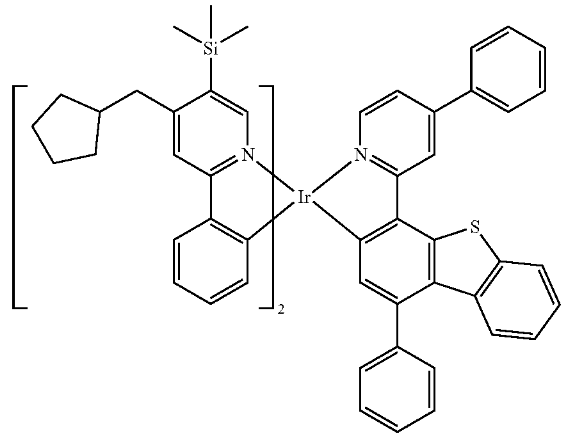
1012
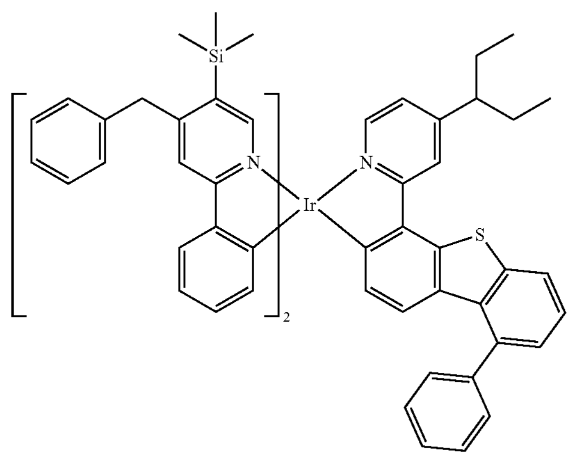
1013
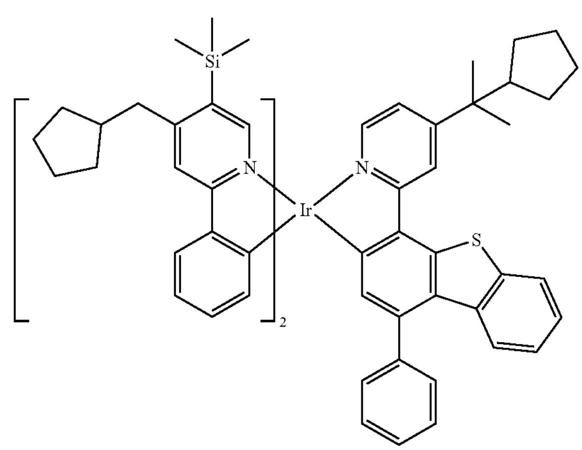

1014
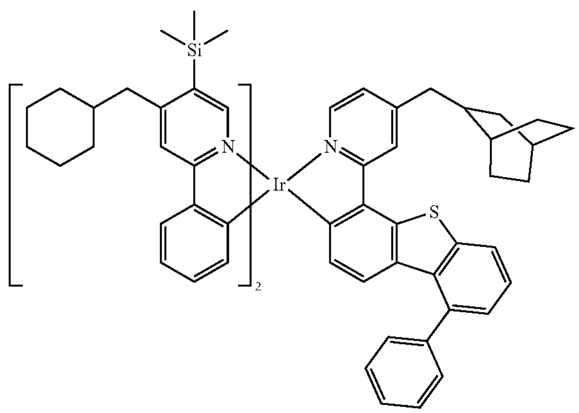
1015
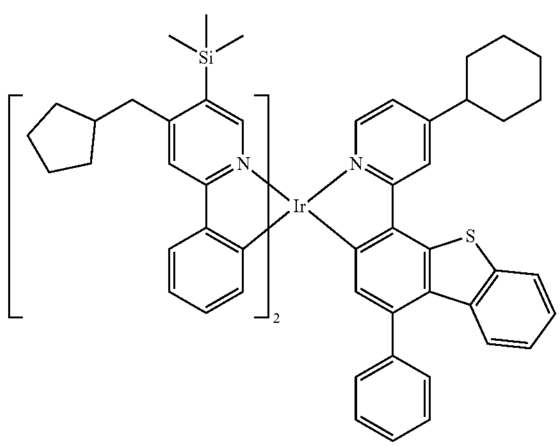
1016
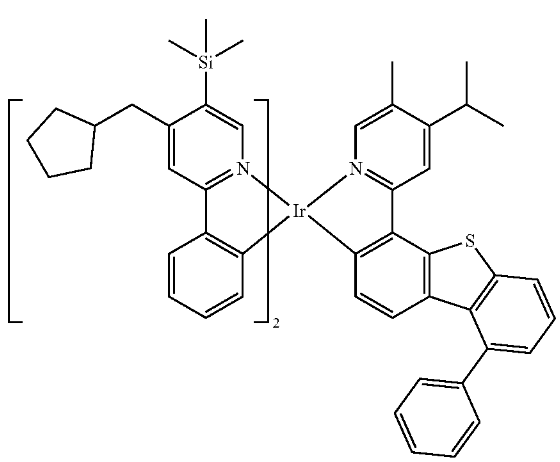
1017
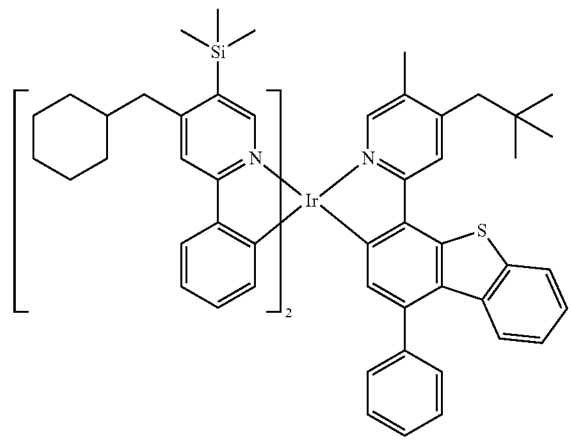
1018
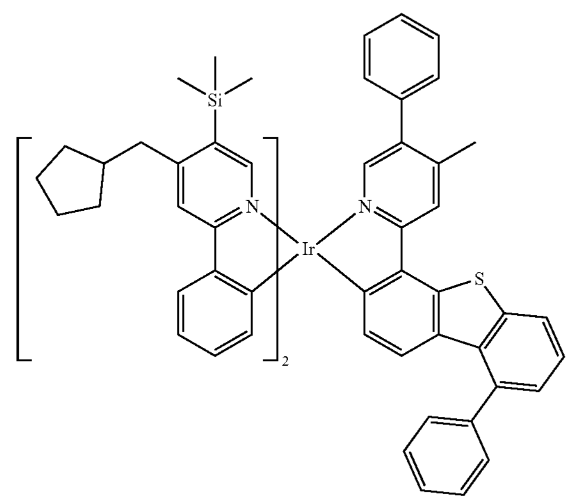
1019
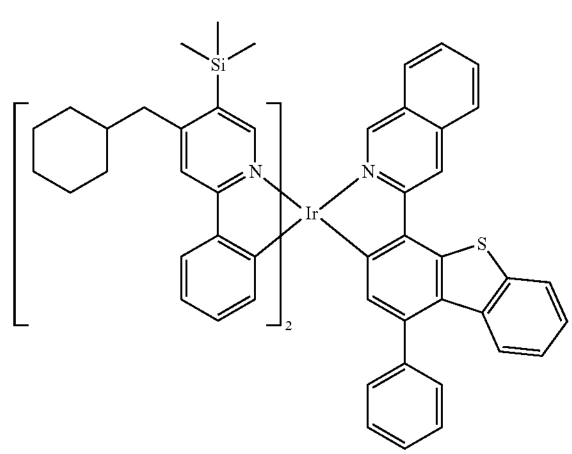

-continued
1020
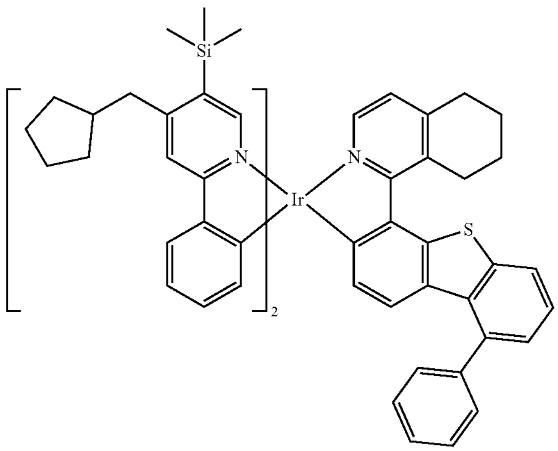
1021
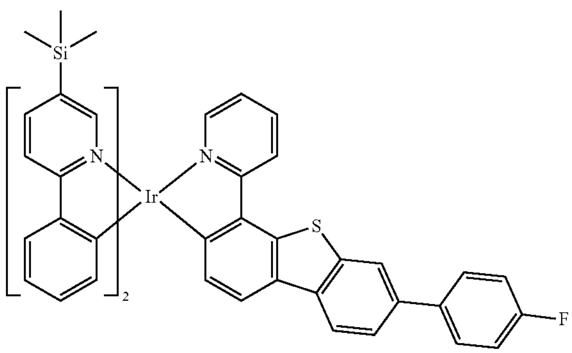
1022
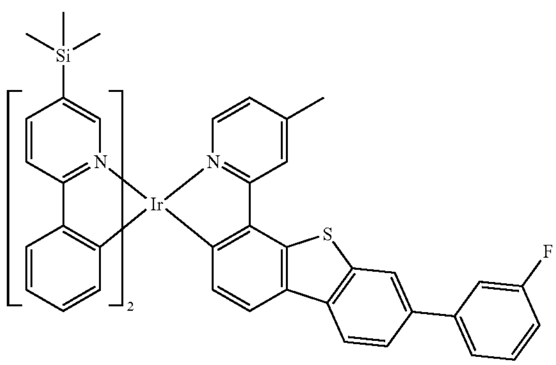
1023
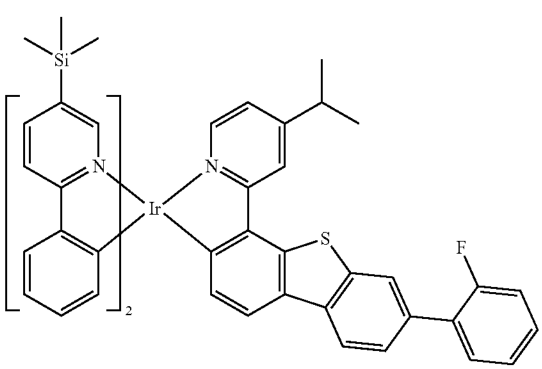
-continued
1024
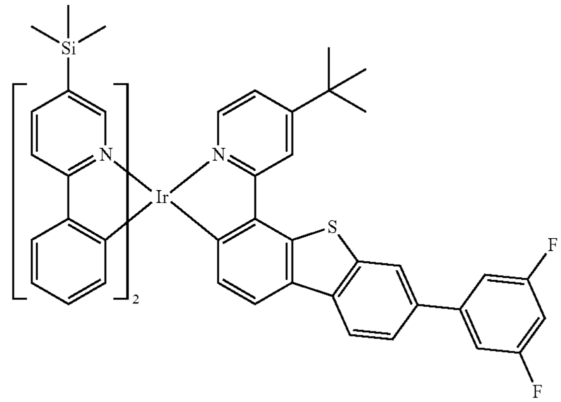
1025
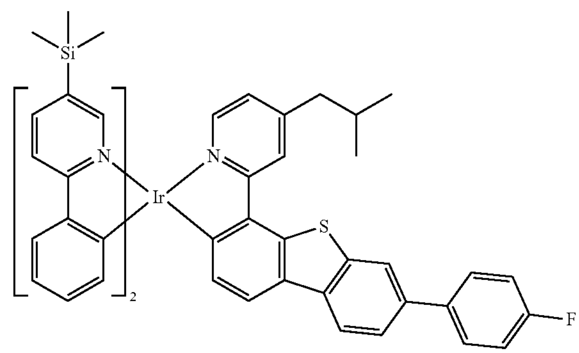
1026
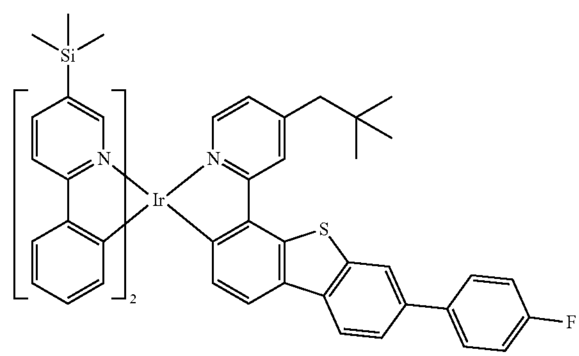
1027
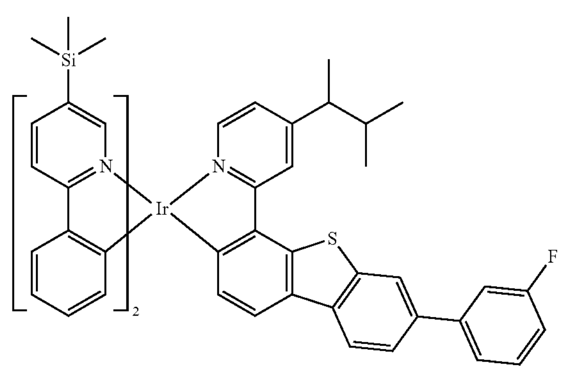

-continued
1028
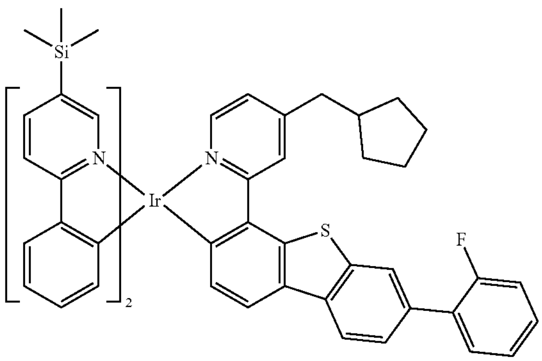
1029
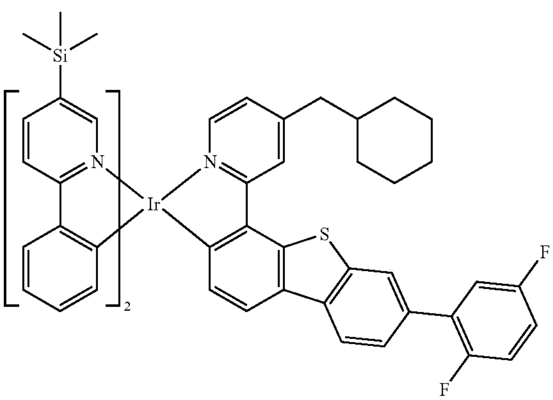
1030
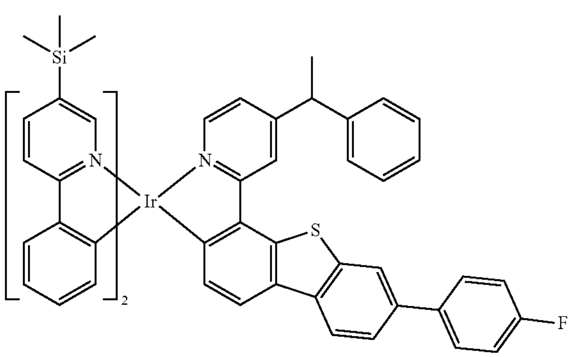
1031
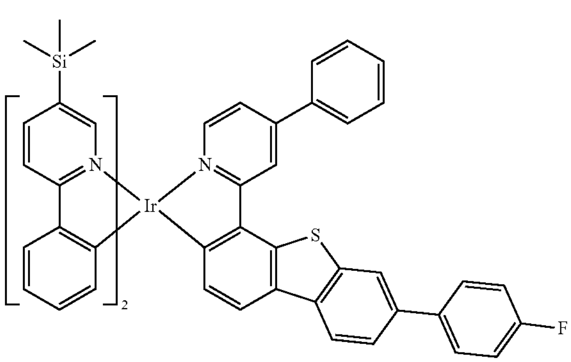
-continued
1032
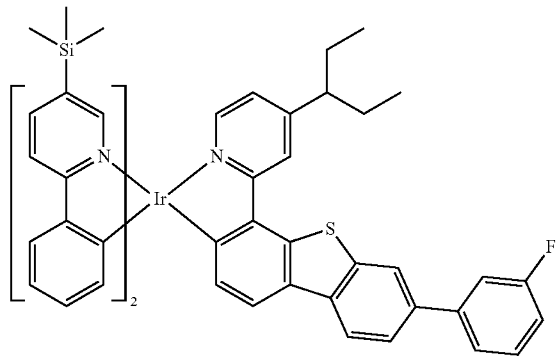
1033
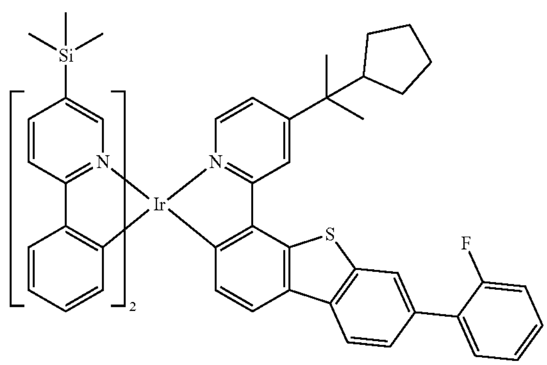
1034
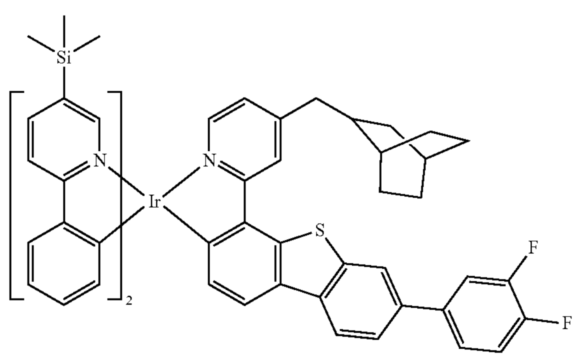
1035
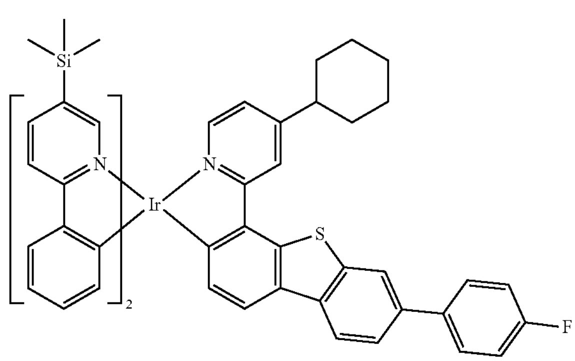

-continued
1036
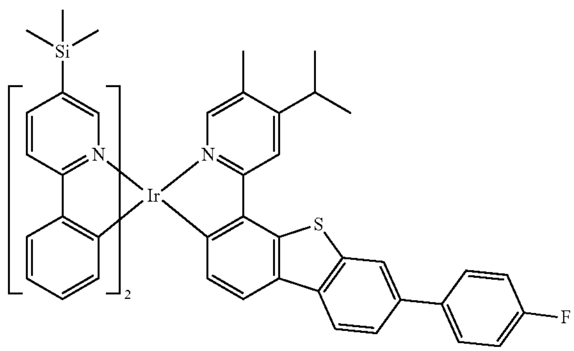
1037
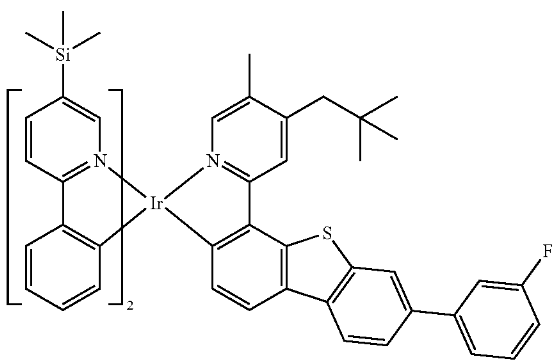
1038
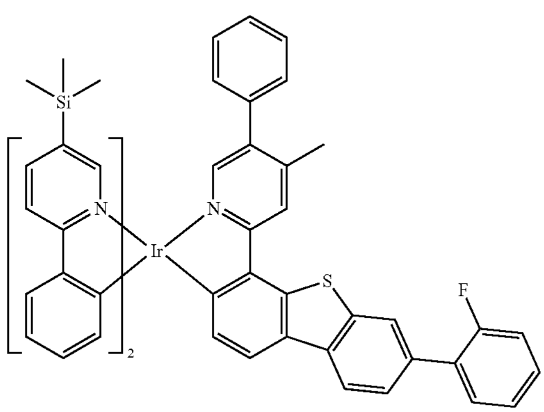
1039
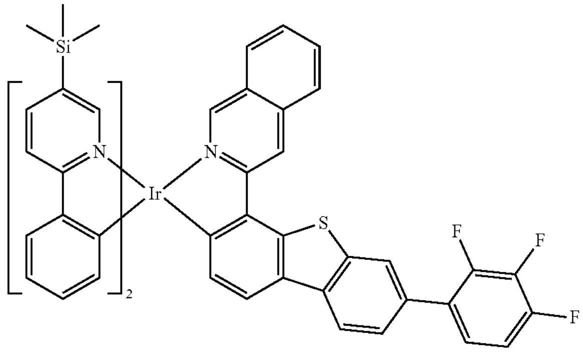
-continued
1040
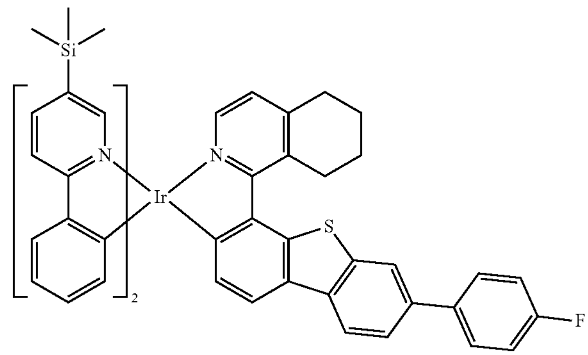
1041
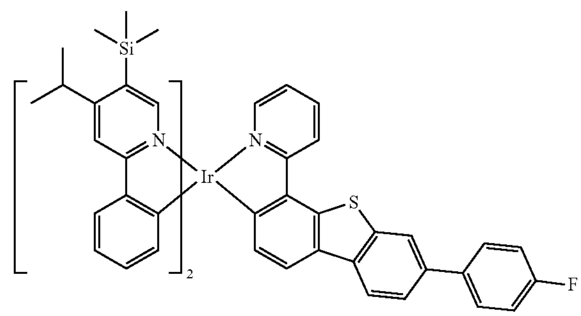
1042
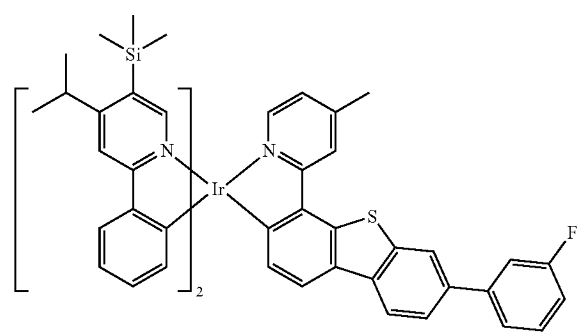
1043
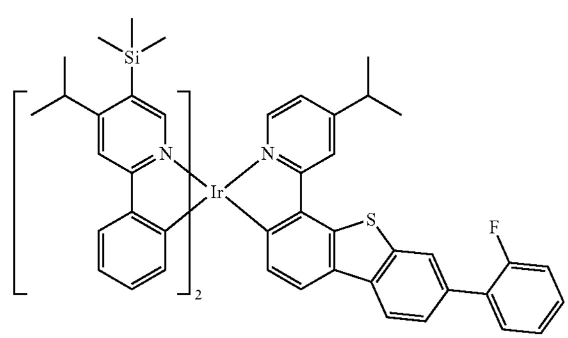

-continued
1044
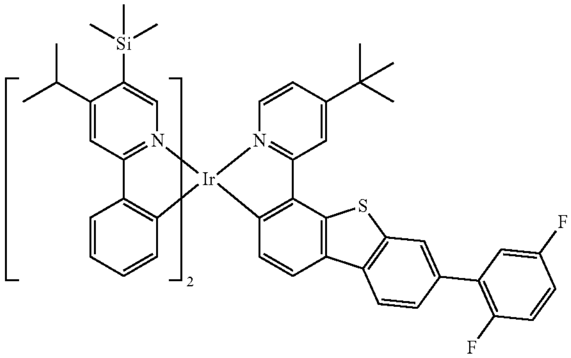
1045
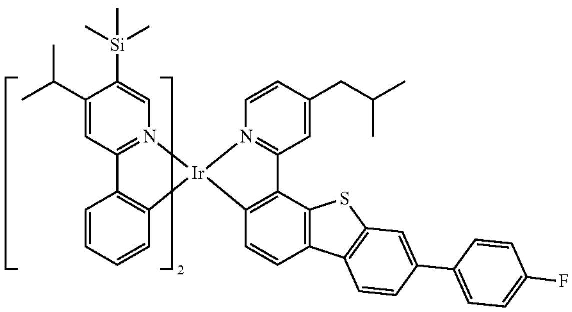
1046
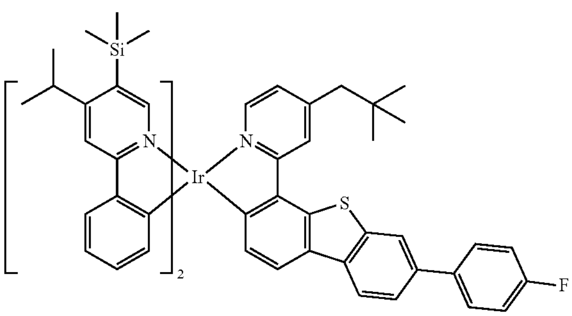
1047
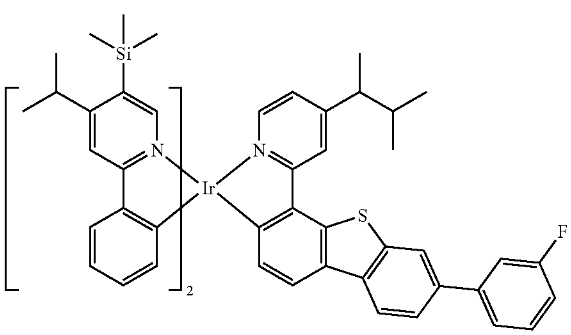
-continued
1048
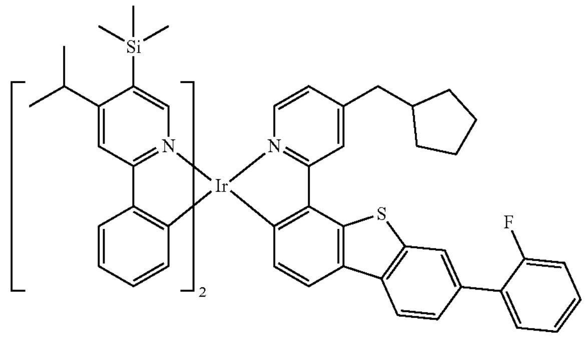
1049
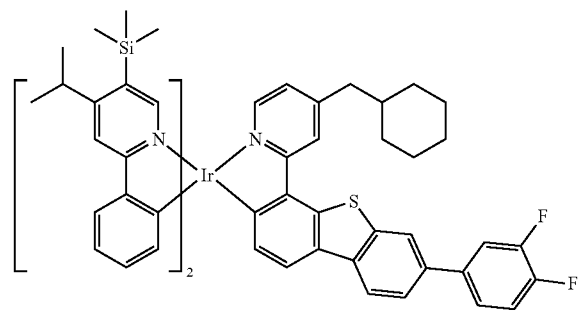
1050
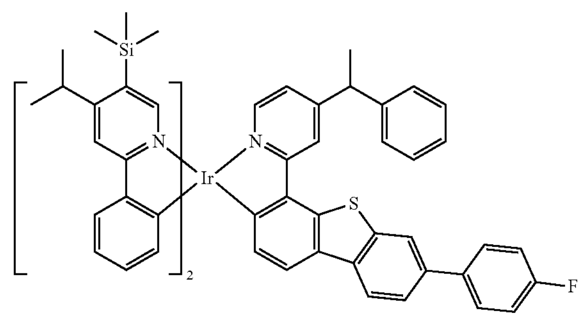
1051
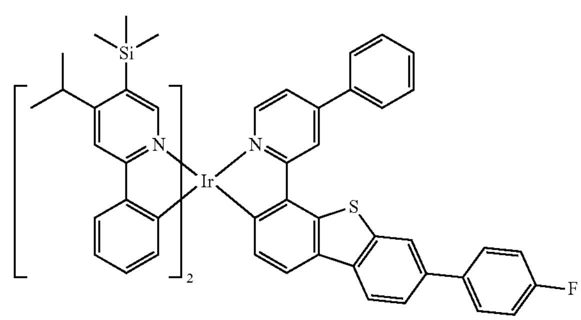

1052
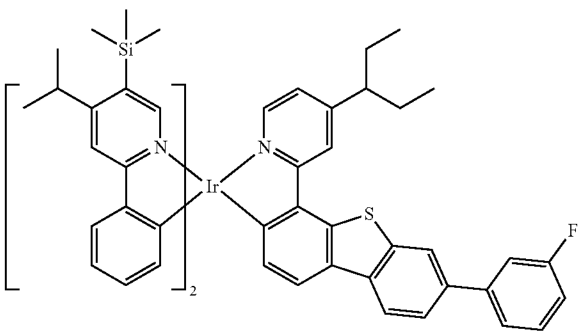
1053
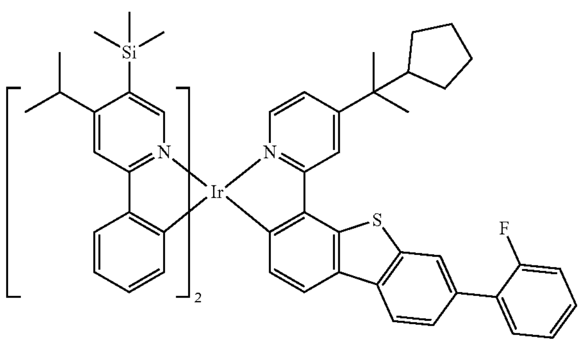
1054
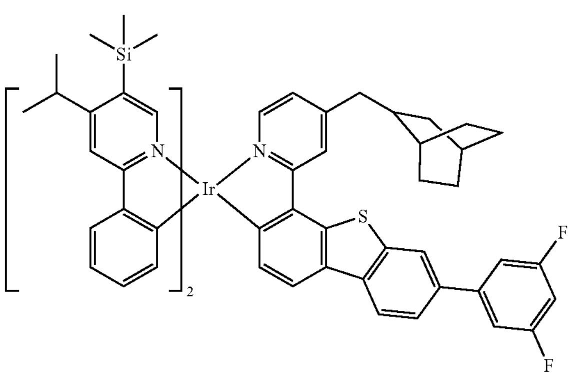
1055
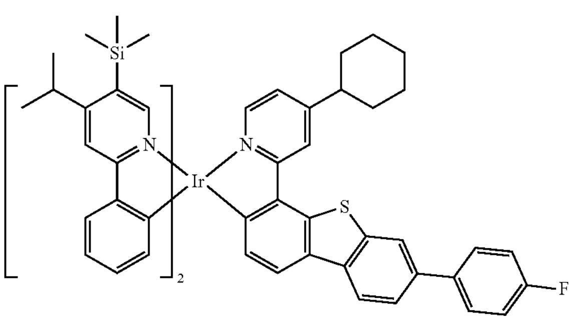
1056
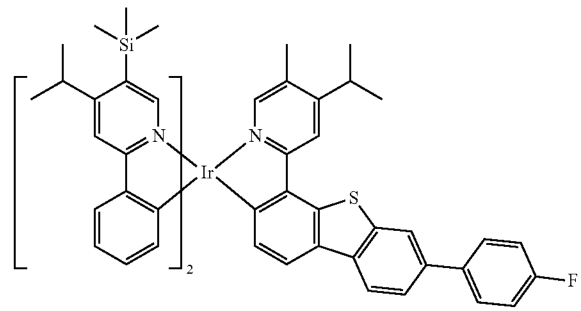
1057
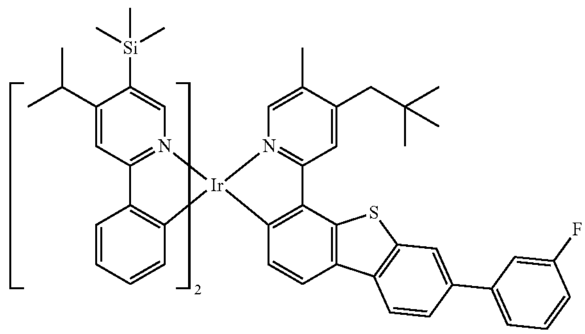
1058
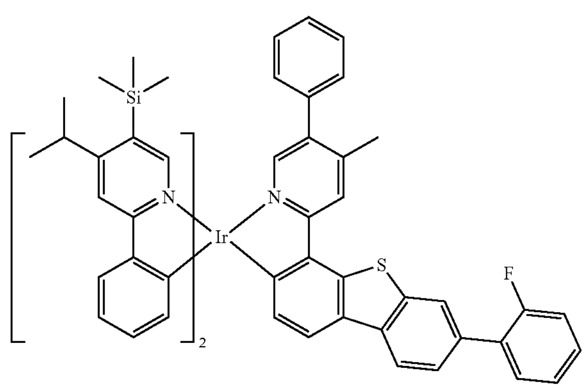
1059
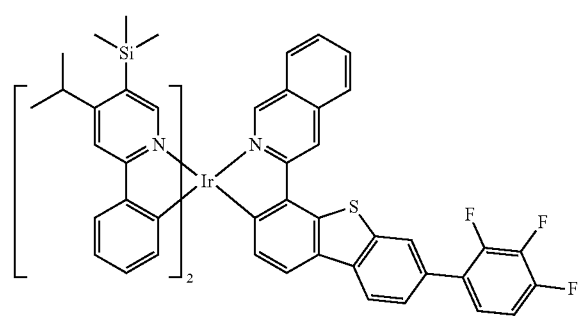

1060
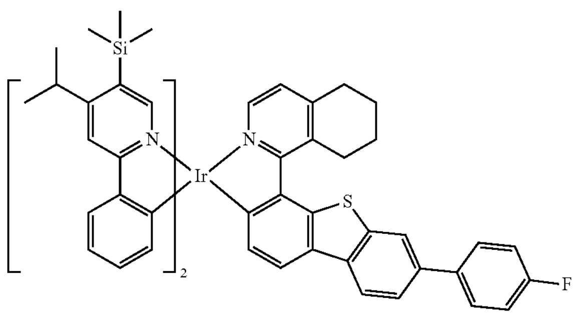
1061
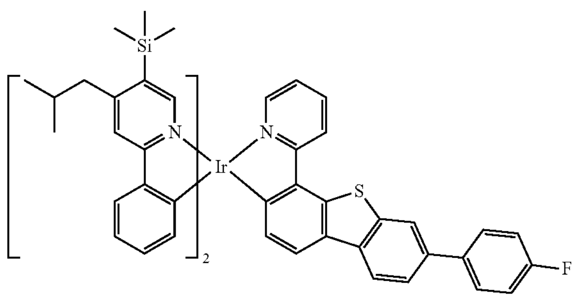
1062
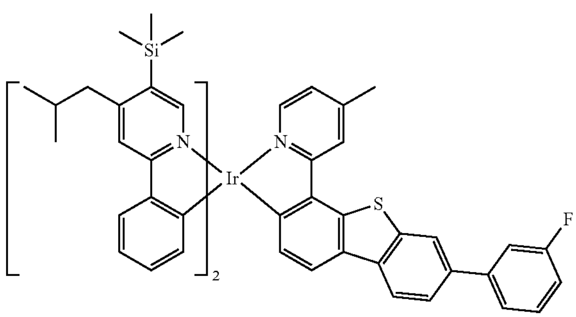
1063
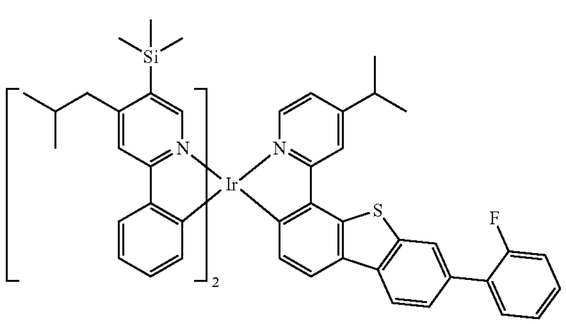
1064
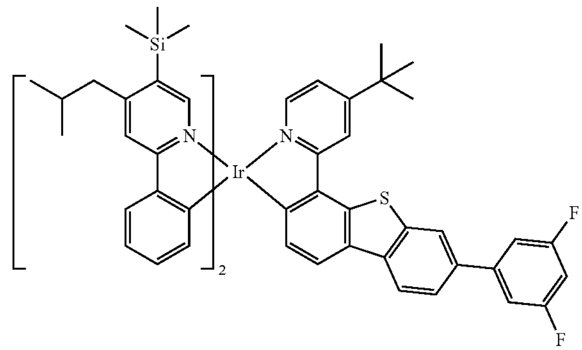
1065
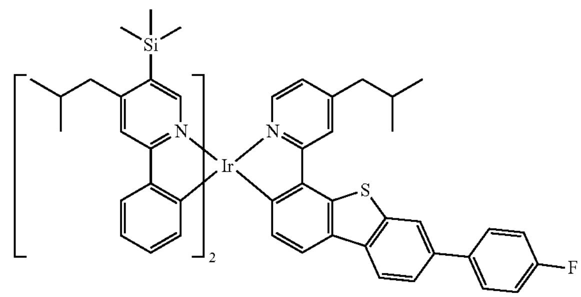
1066
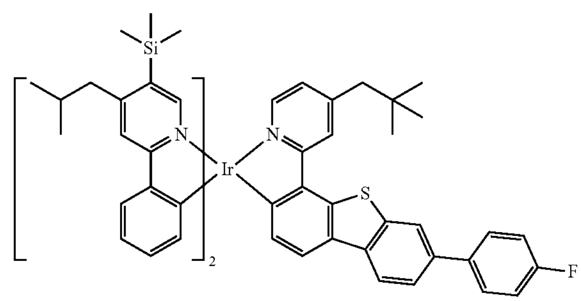
1067
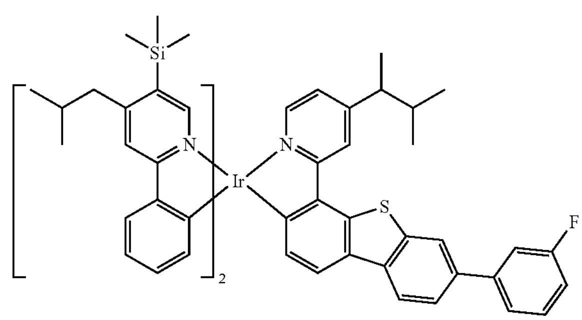

-continued
1068
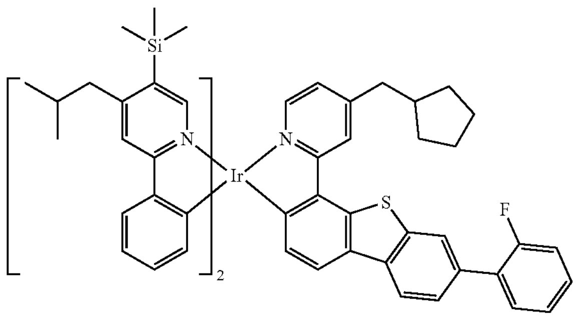
1069
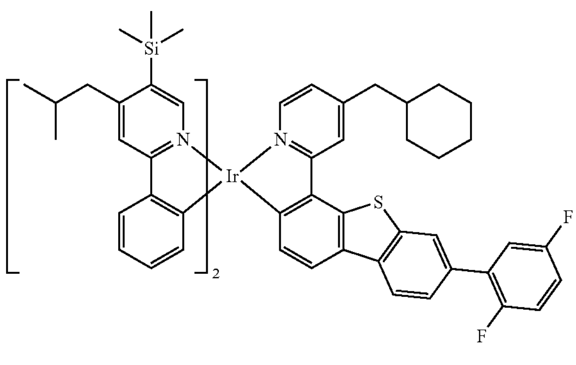
1070
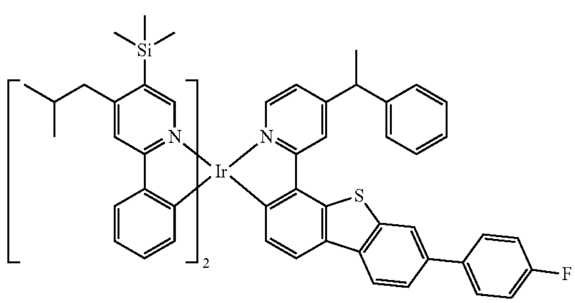
1071
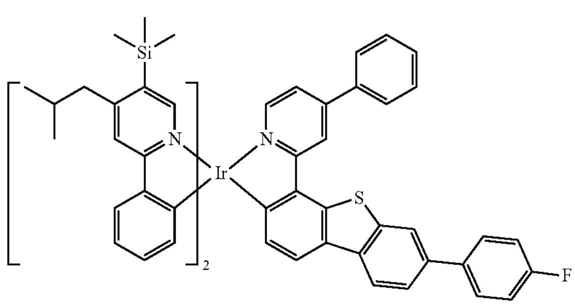
-continued
1072
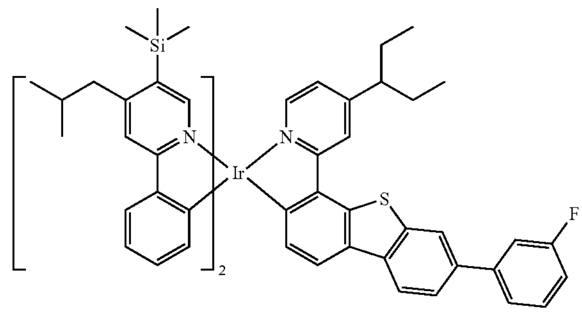
1073
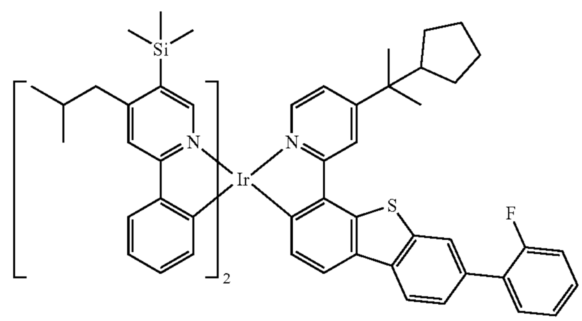
1074
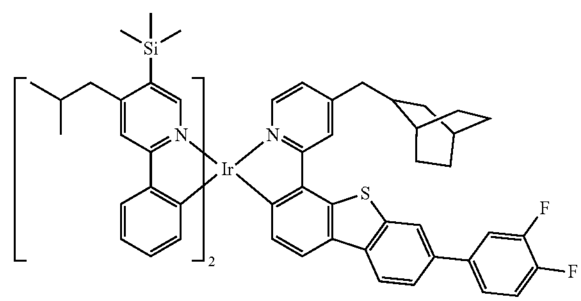
1075
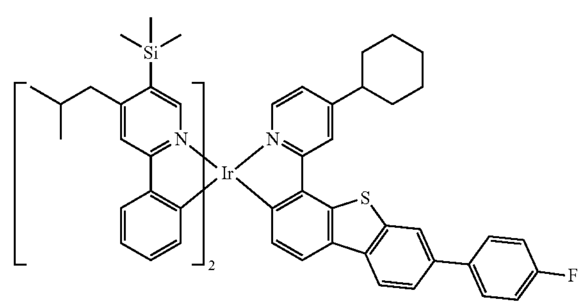
1076
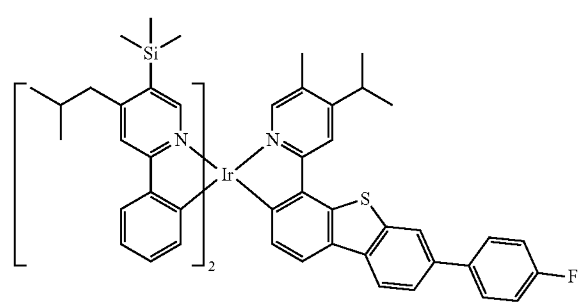

-continued
1077
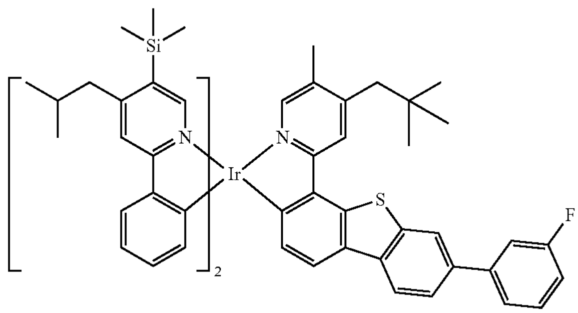
1078
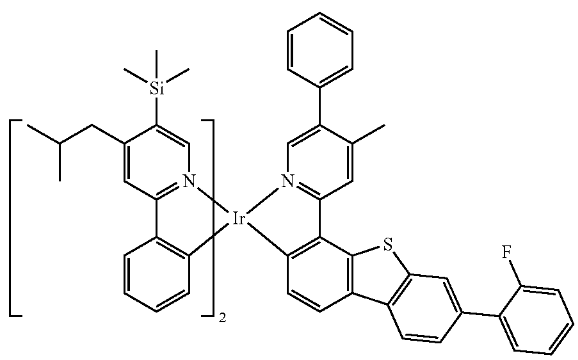
1079
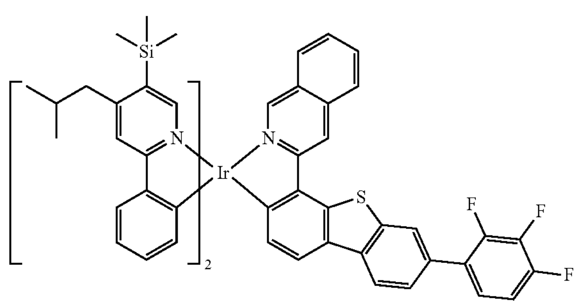
1080
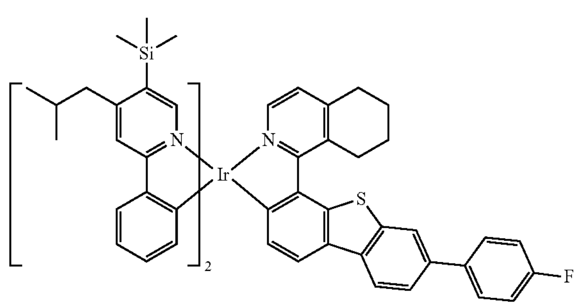
-continued
1081
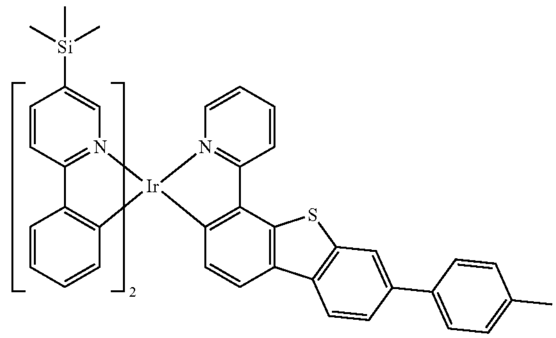
1082
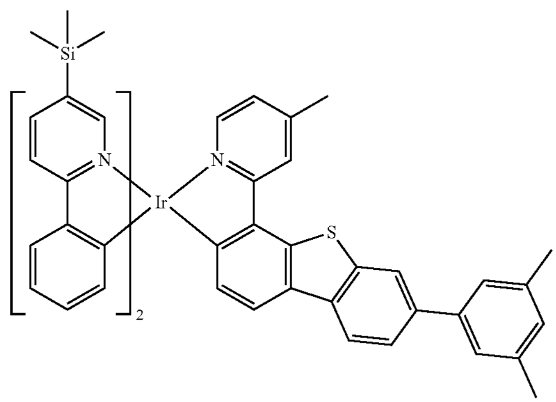
1083
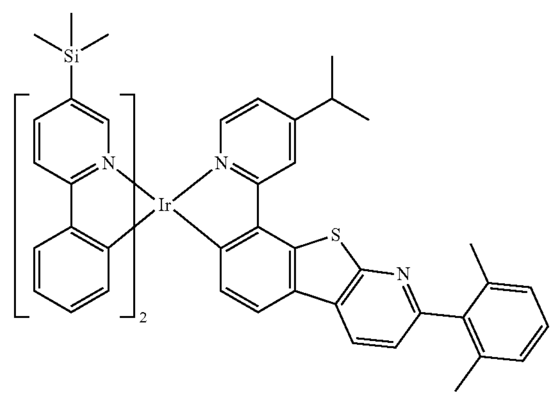
1084
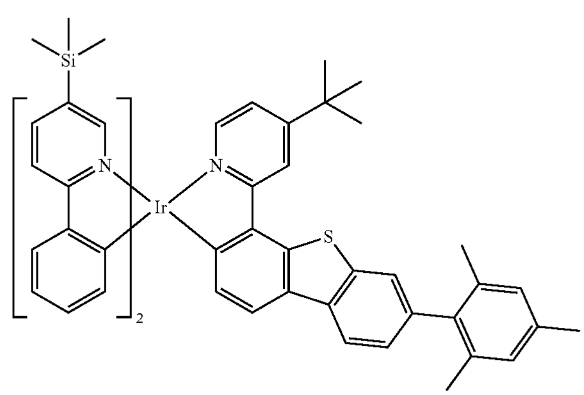

-continued
1085
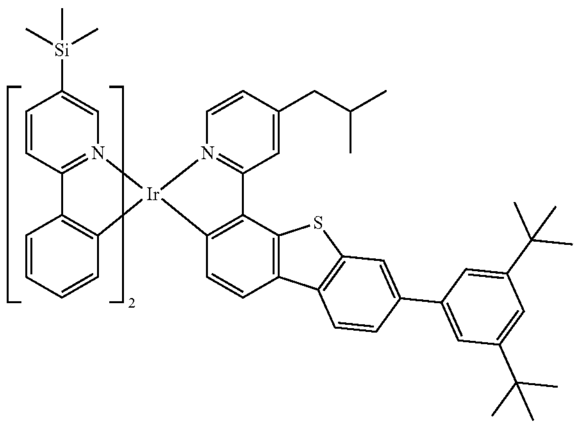
1086
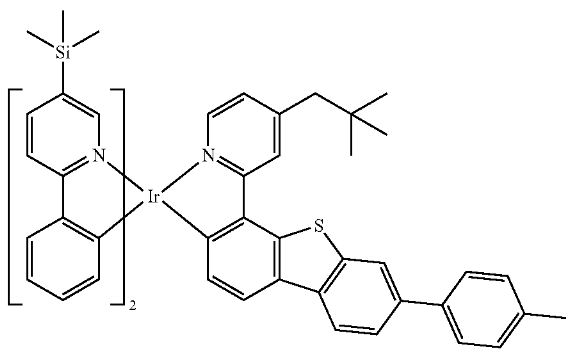
1087
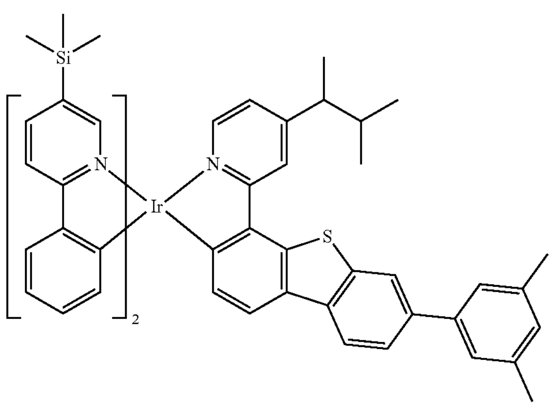
1088
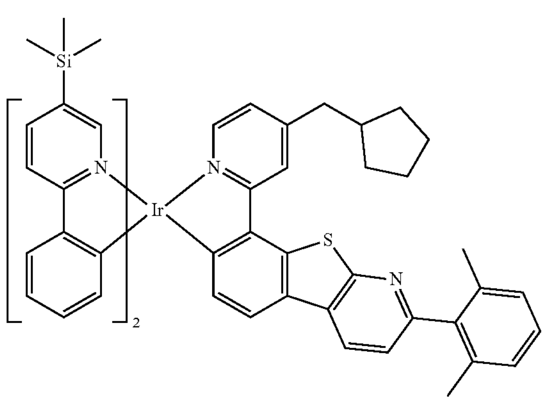
-continued
1089
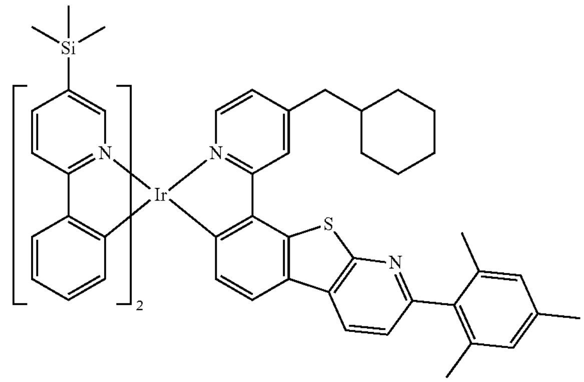
1090
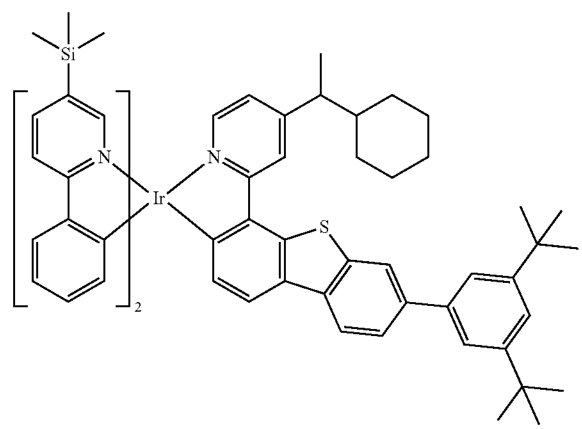
1091
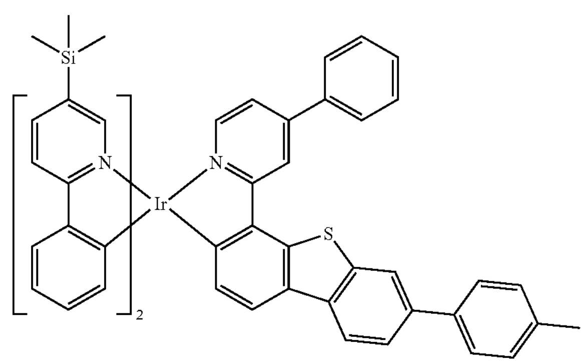
1092
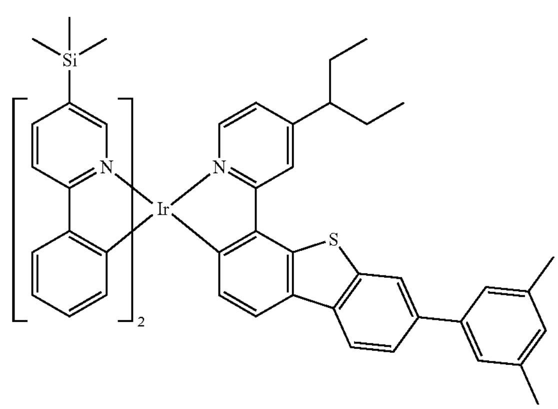

-continued
1093
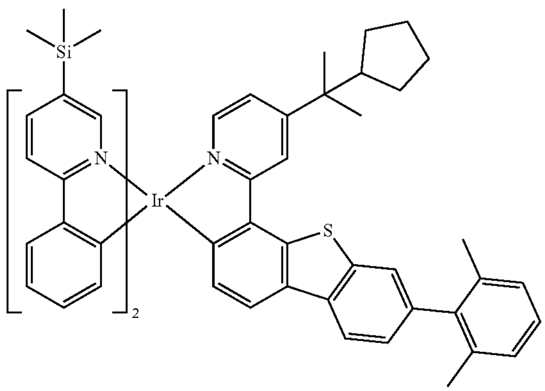
1094
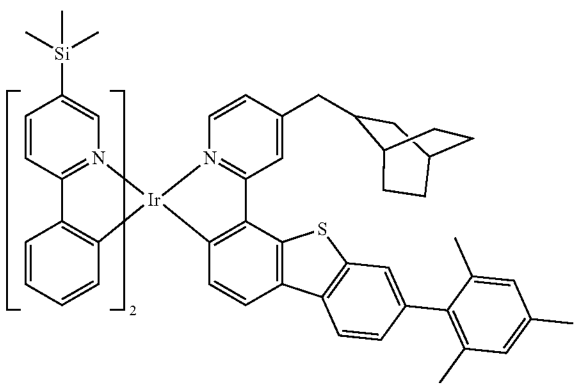
1095
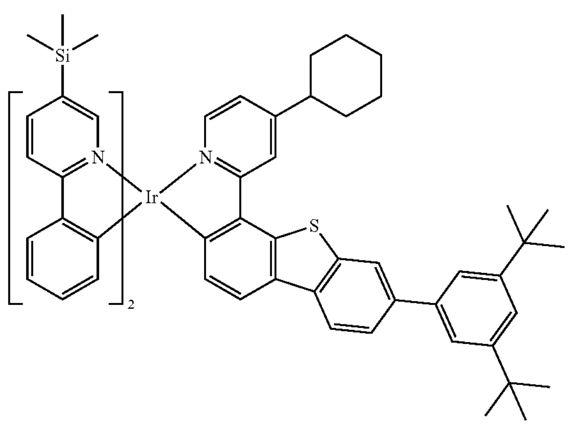
1096
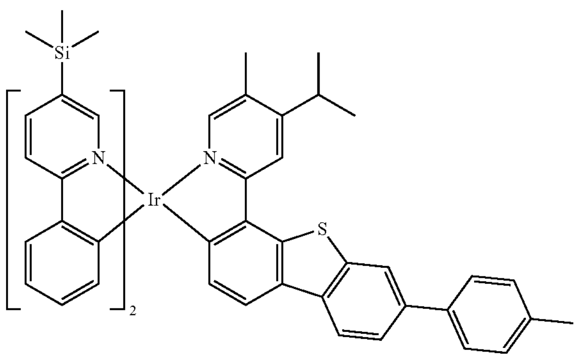
1097
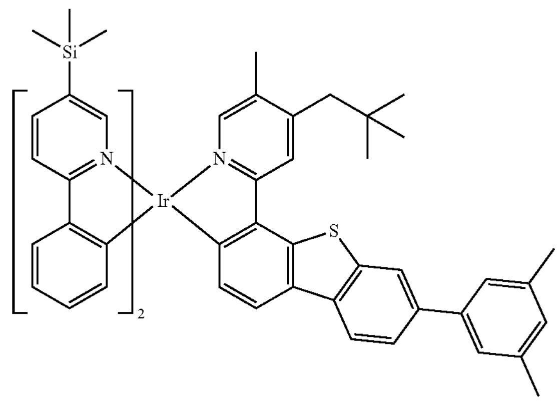
1098
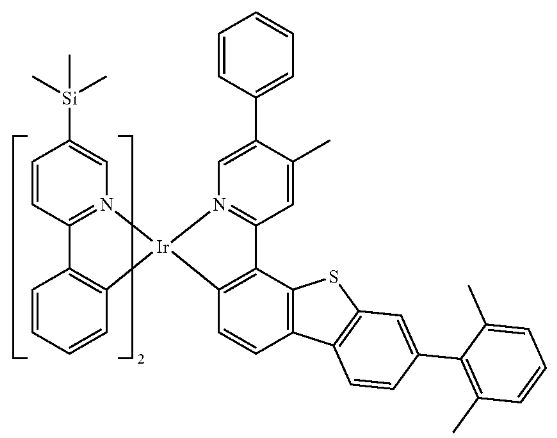
1099
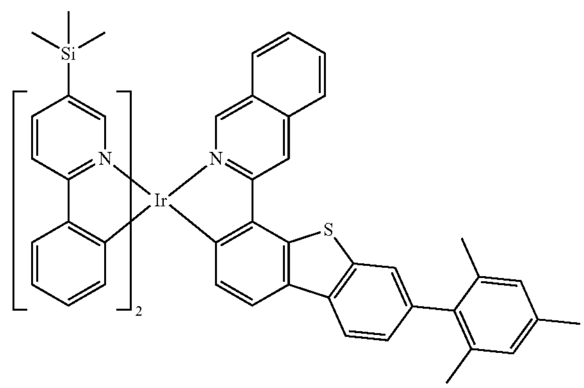

1100
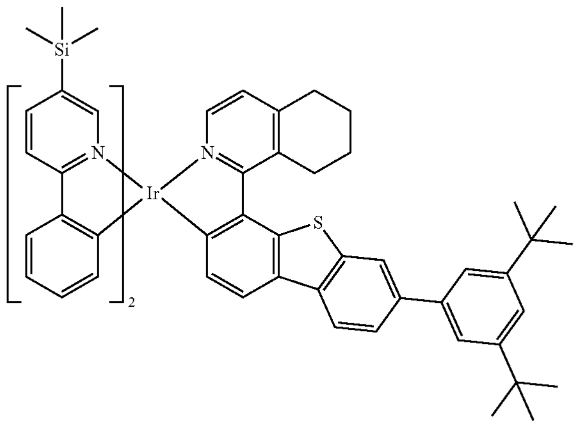
1101
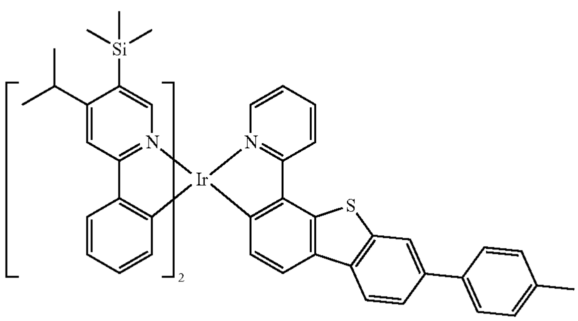
1102
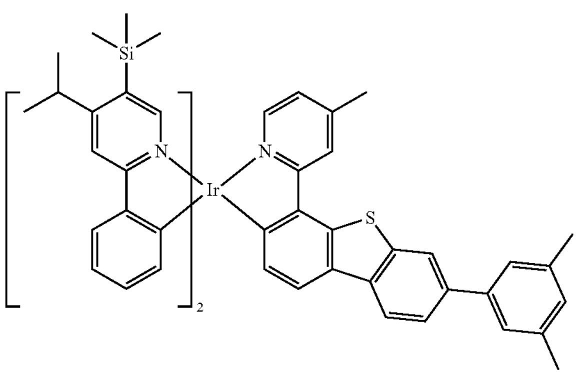
1103
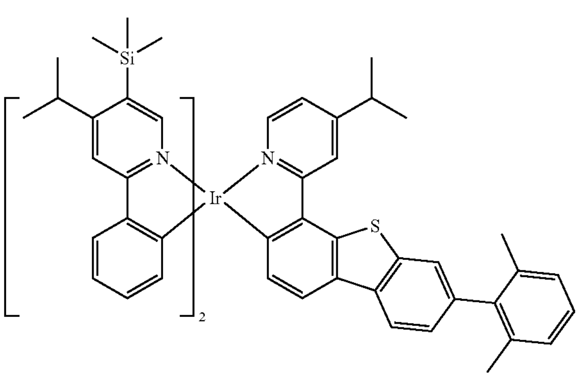
1104
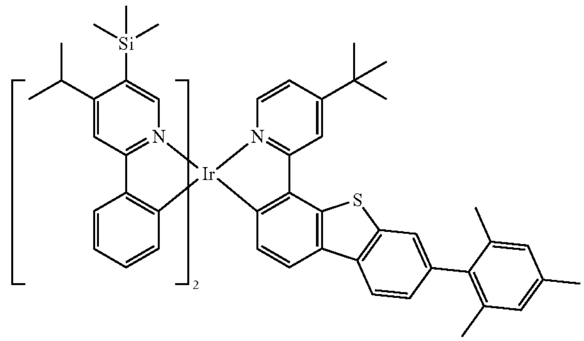
1105
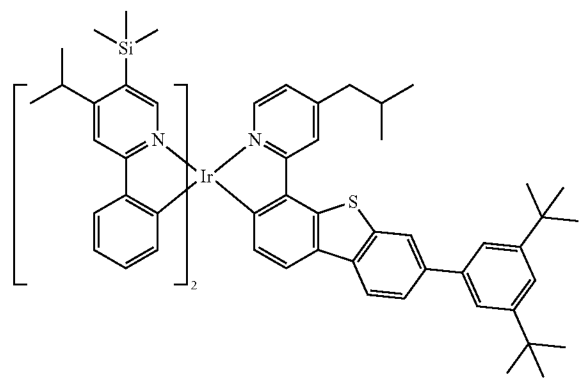
1106
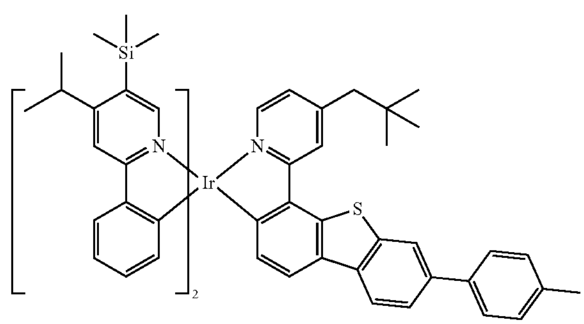
1107
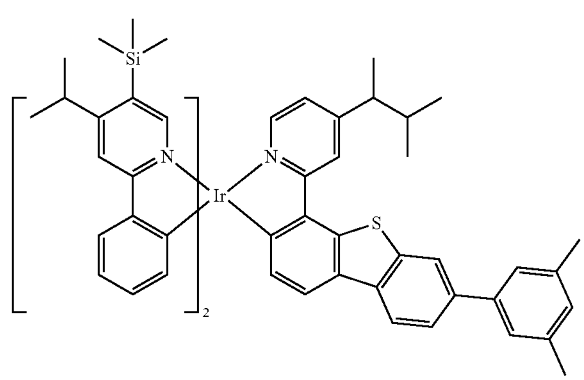

-continued
1108
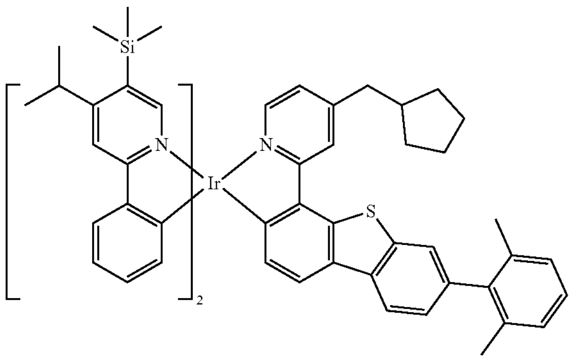
1109
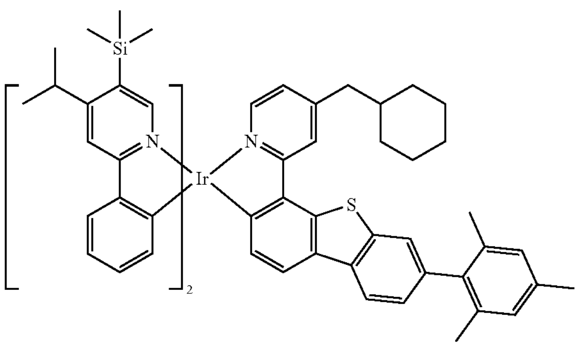
1110
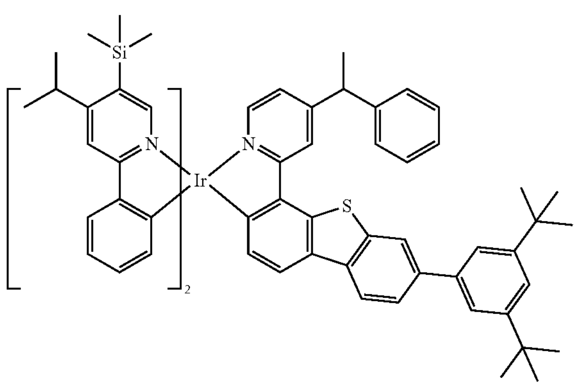
1111
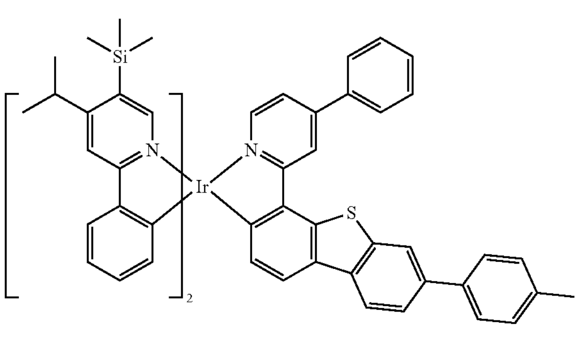
-continued
1112
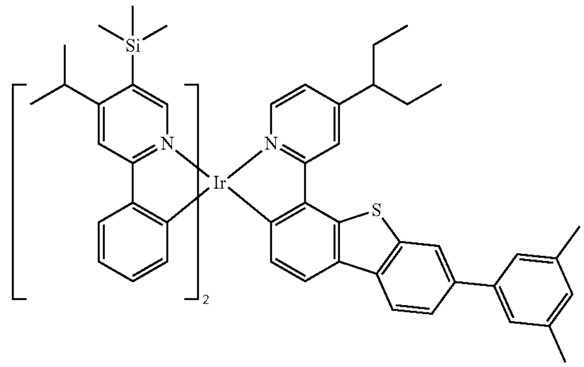
1113
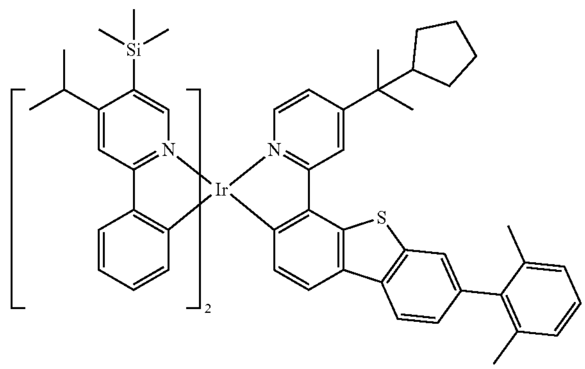
1114
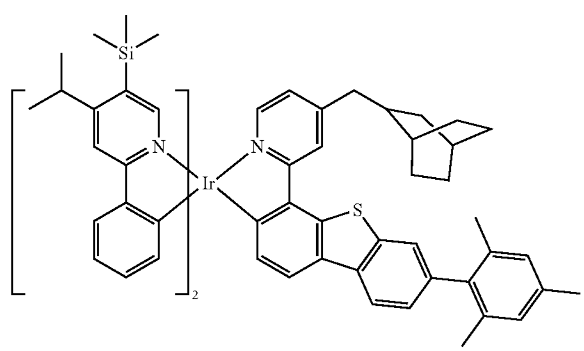
1115
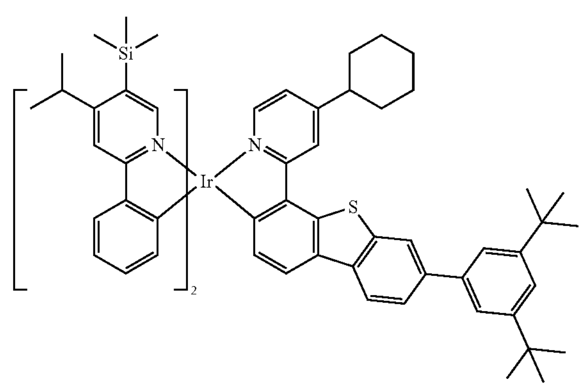

-continued
1116
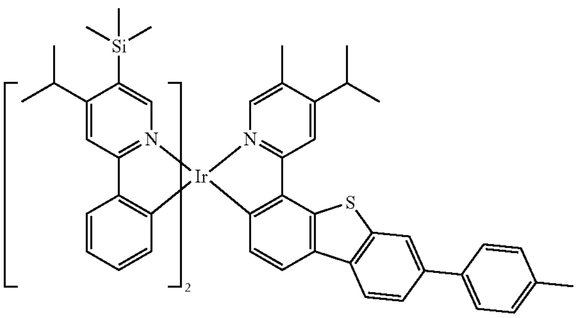
1117
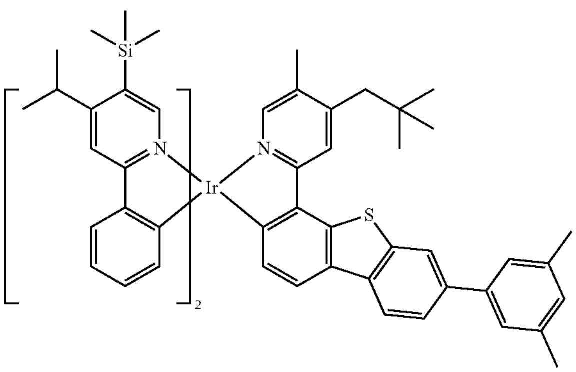
1118
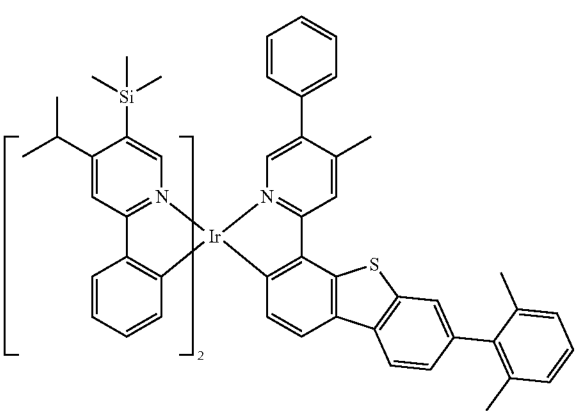
1119
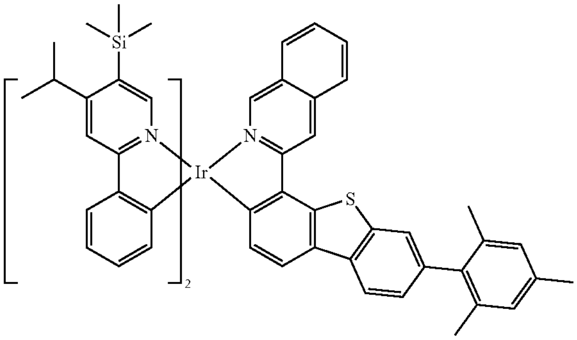
-continued
1120
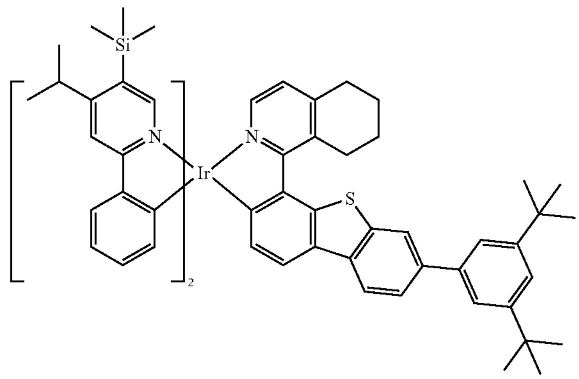
1121
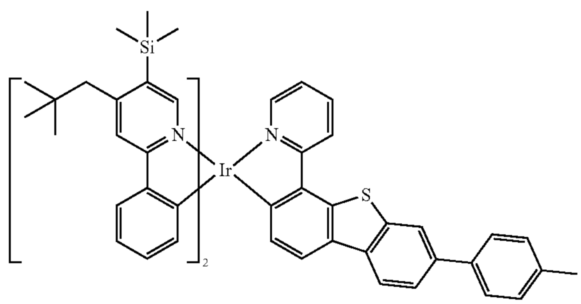
1122
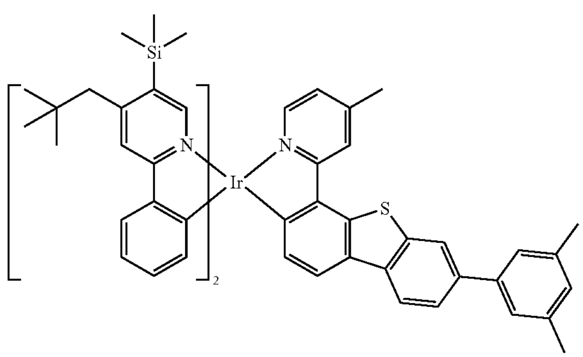
1123
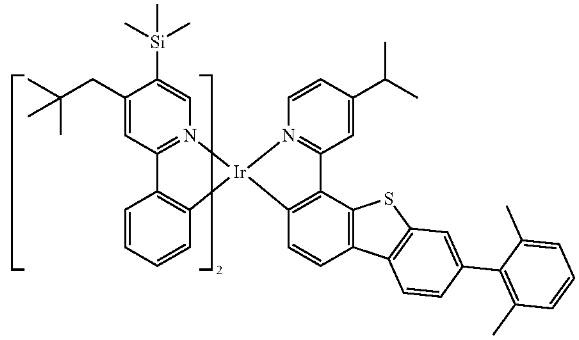

1124
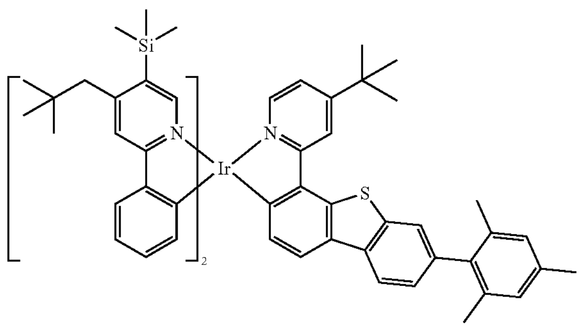
1125
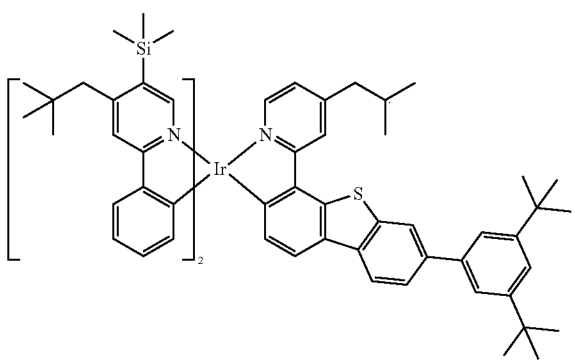
1126
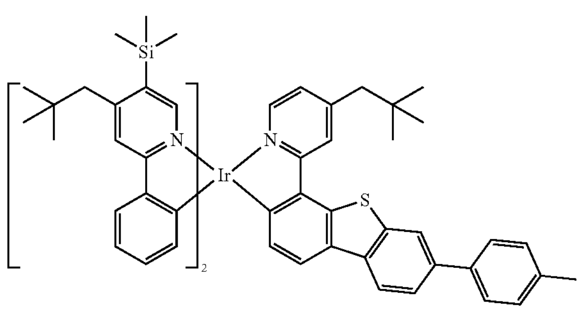
1127
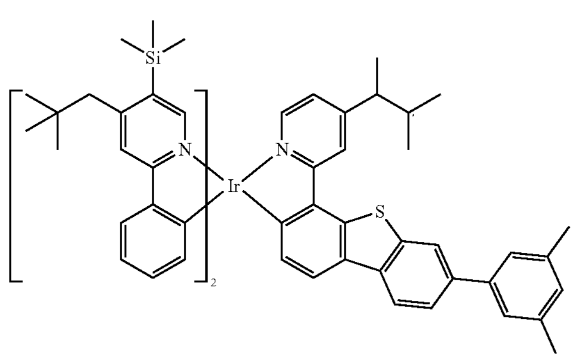
1128
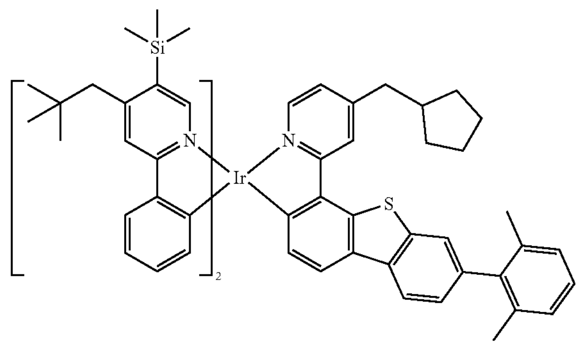
1129
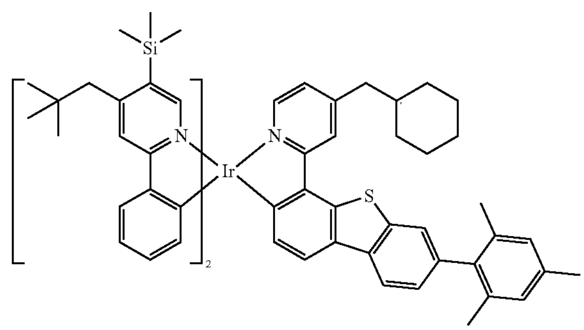
1130
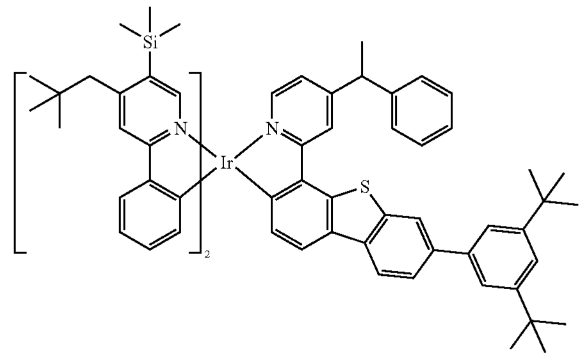
1131
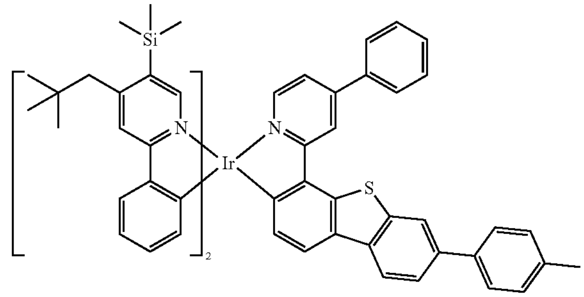

-continued
1132
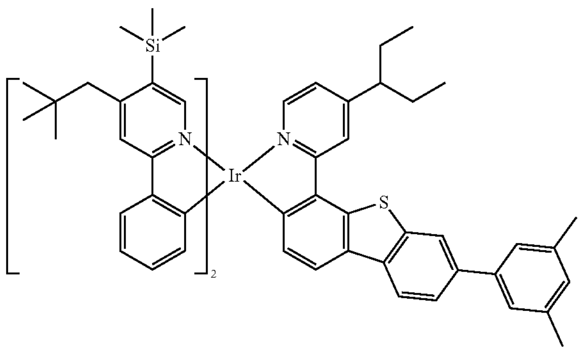
1133
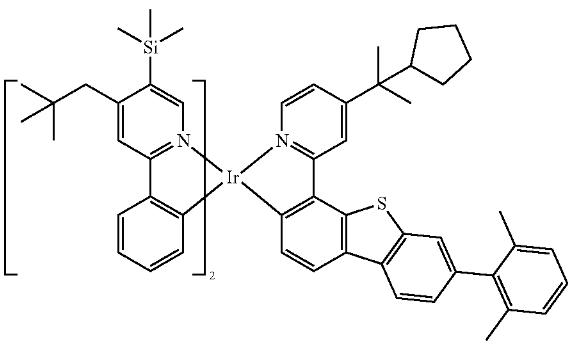
1134
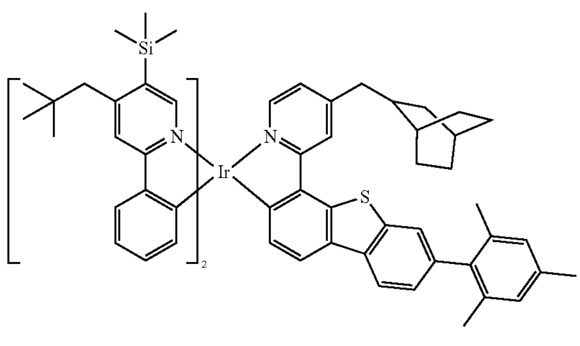
1135
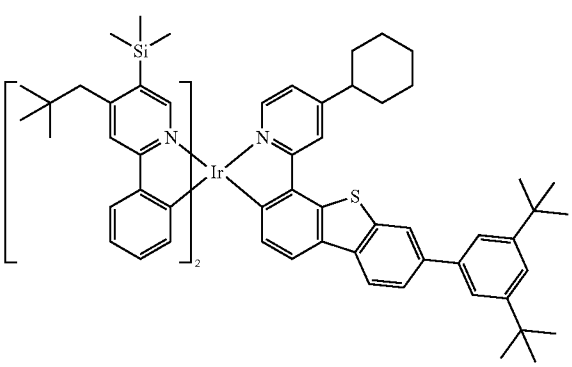
-continued
1136
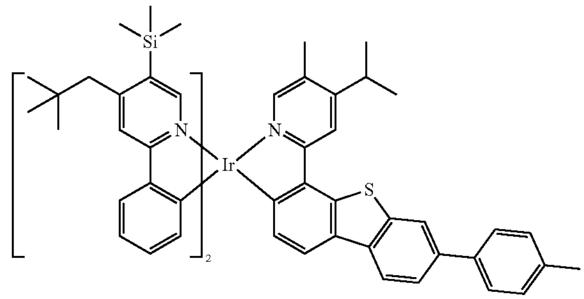
1137
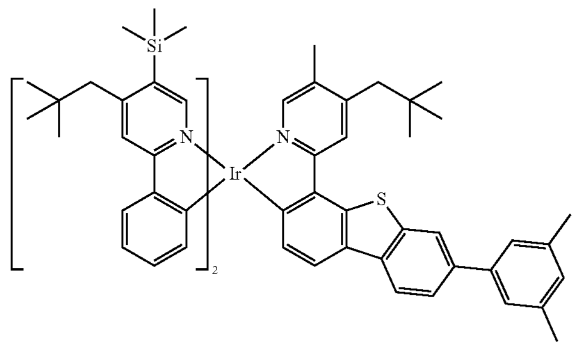
1138
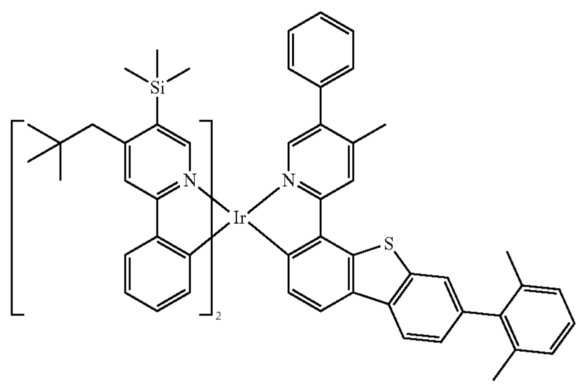
1139
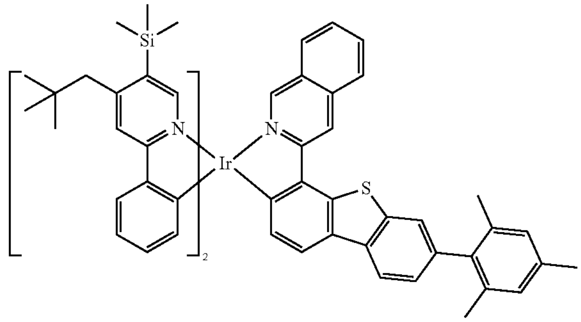

-continued
1140
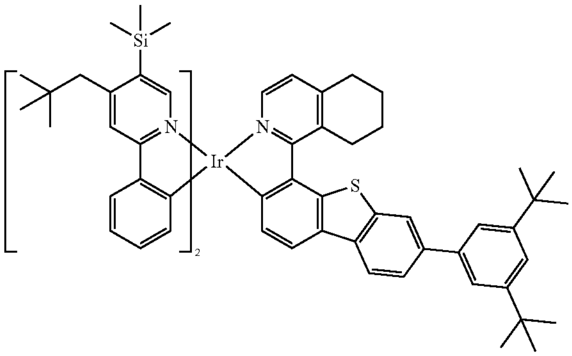
1141
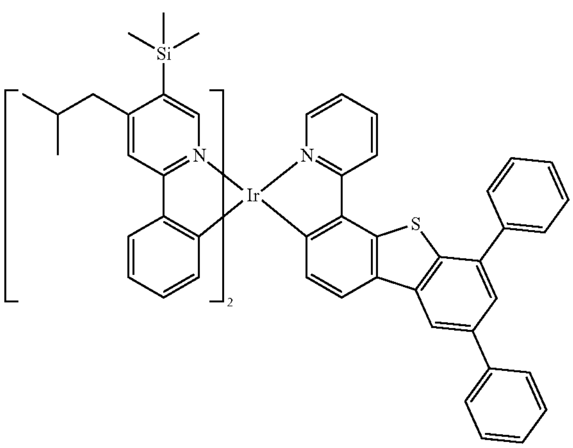
1142
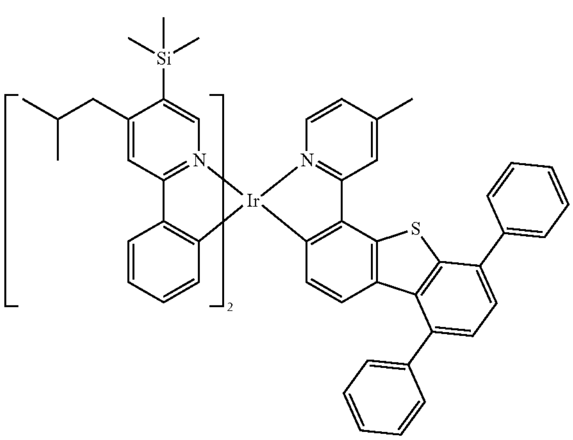
-continued
1143
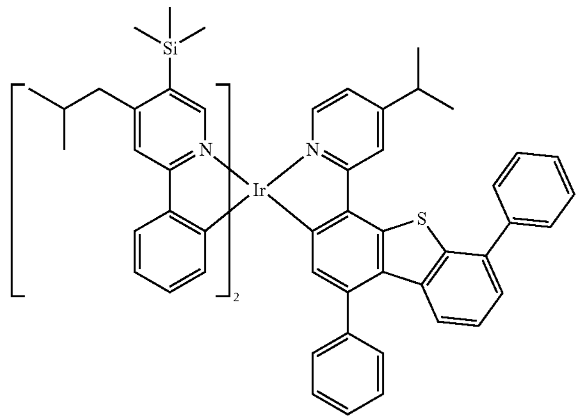
1144
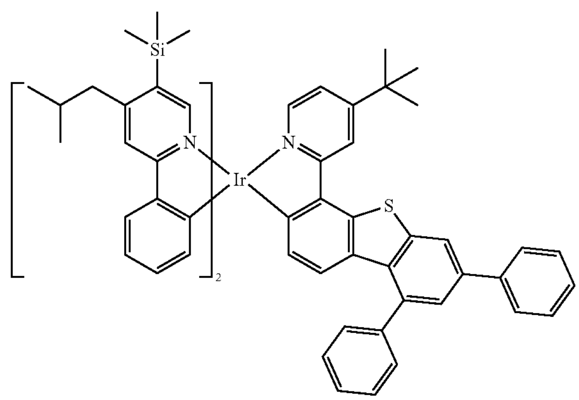
1145
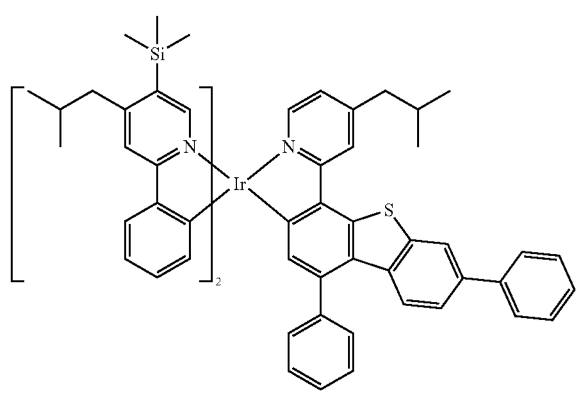

-continued
1146
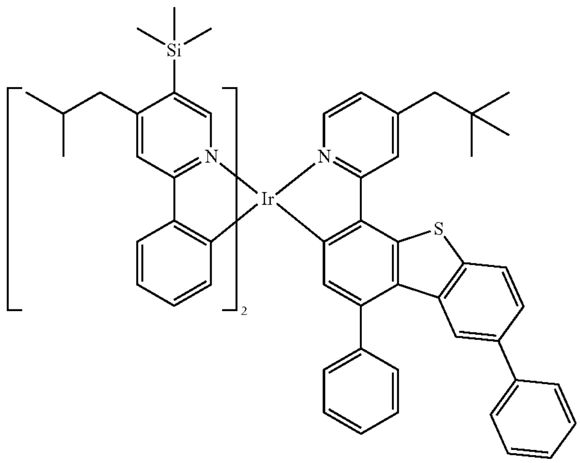
1147
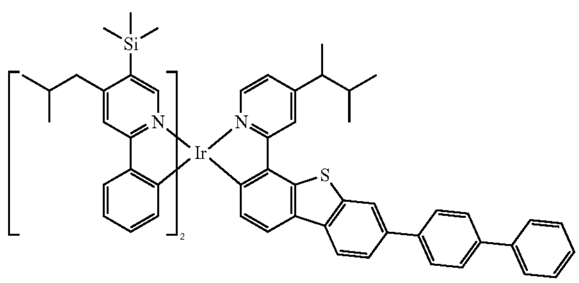
1148
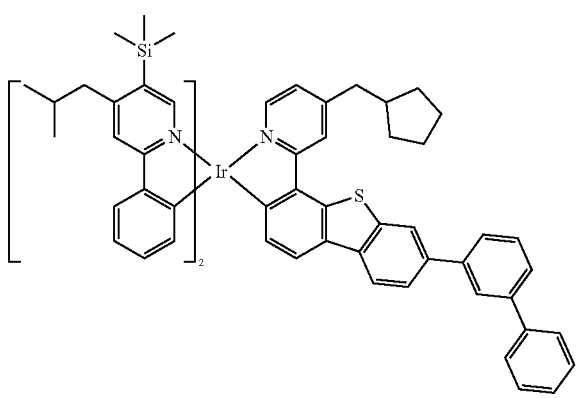
1149
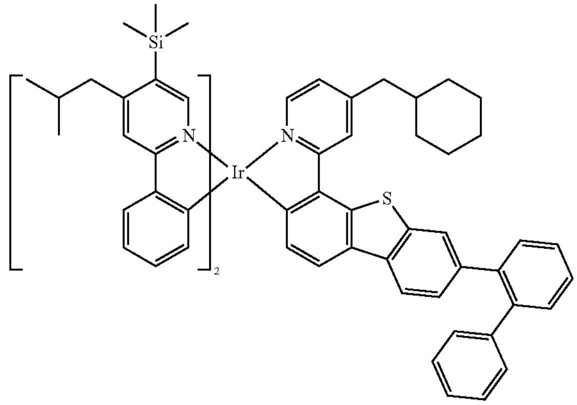
-continued
1150
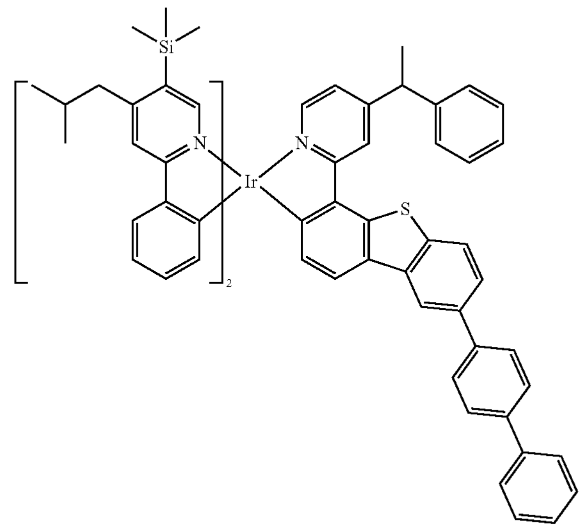
1151
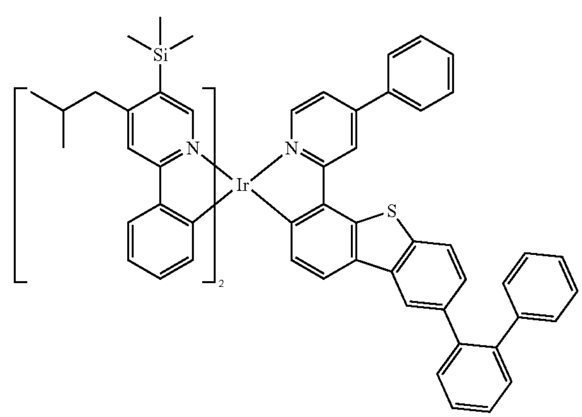
1152
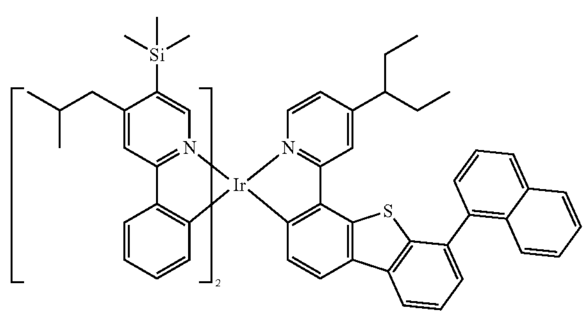
1153
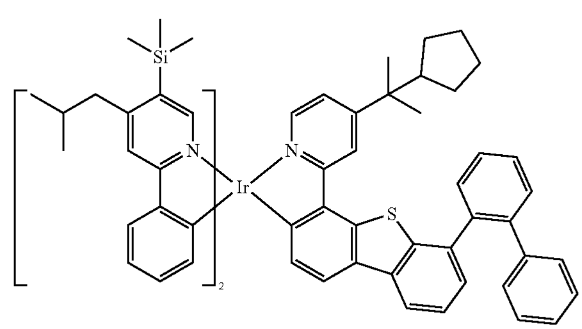

1154
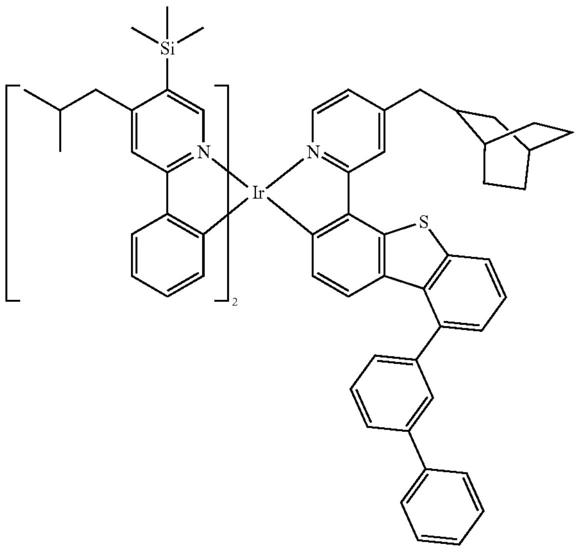
1155
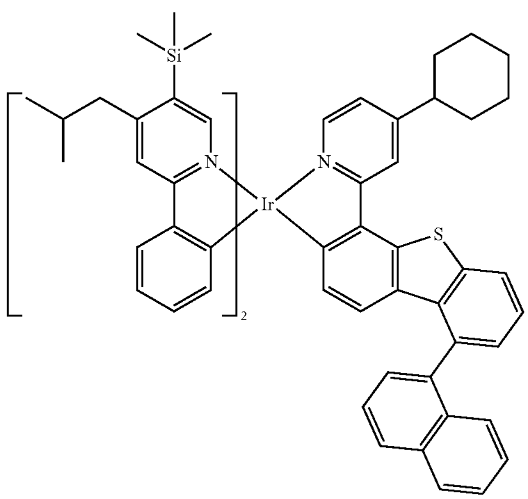
1156
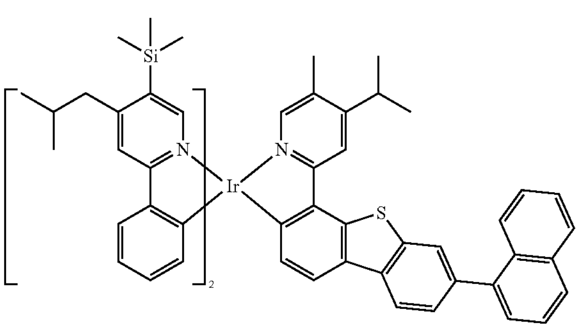
1157
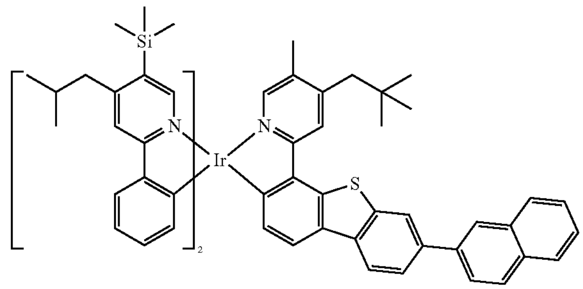
1158
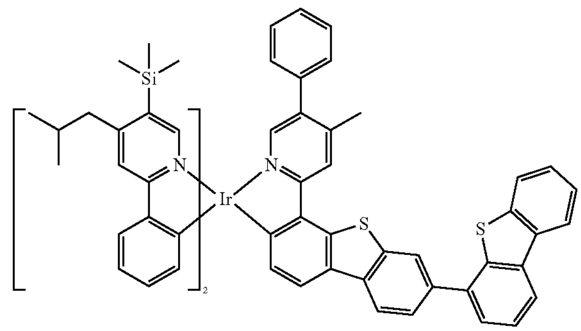
1159
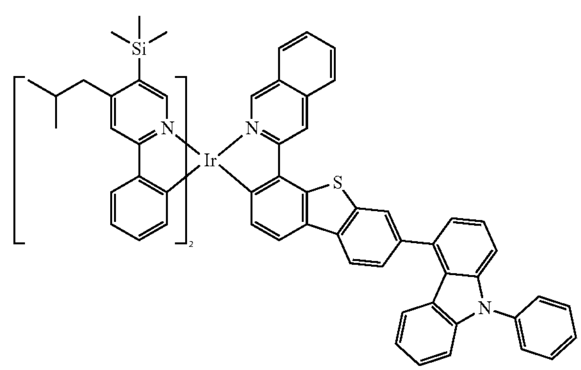
1160
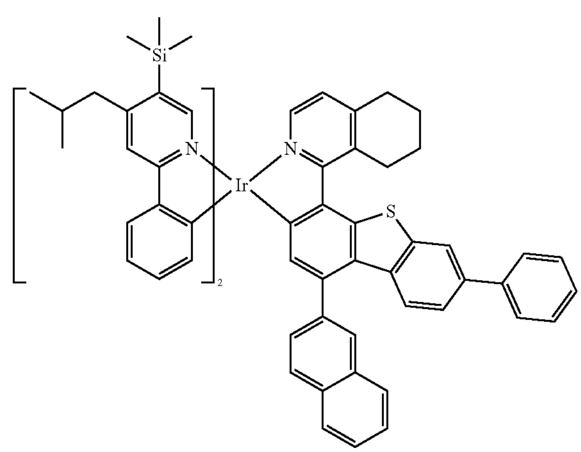

-continued
1161
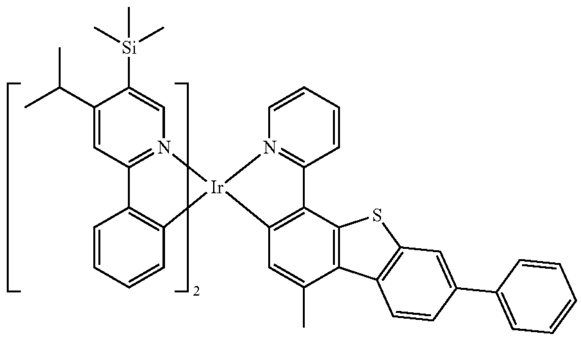
1162
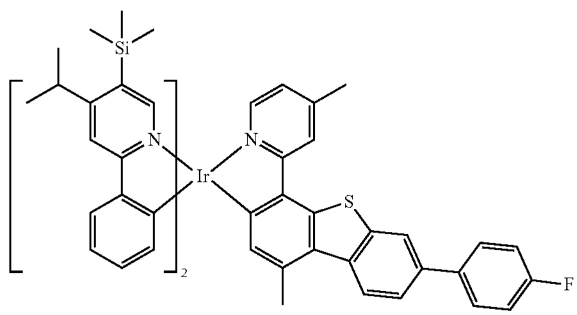
1163
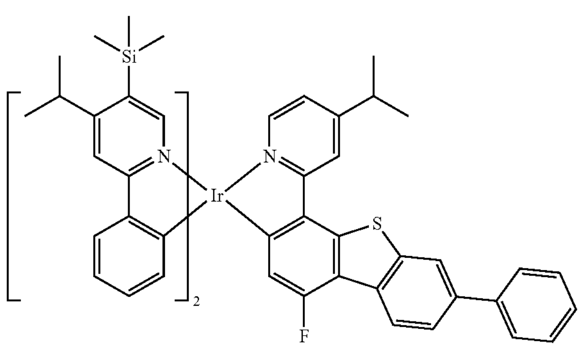
1164
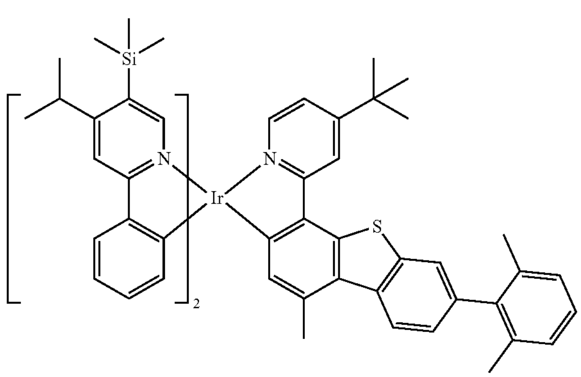
-continued
1165
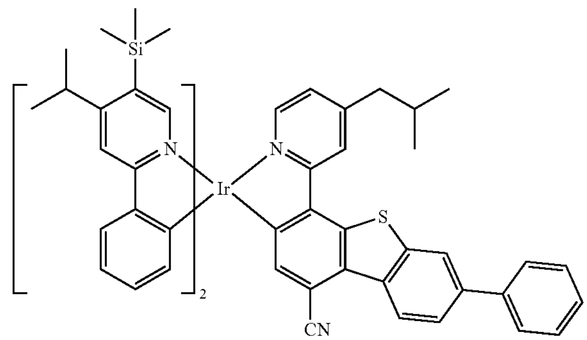
1166
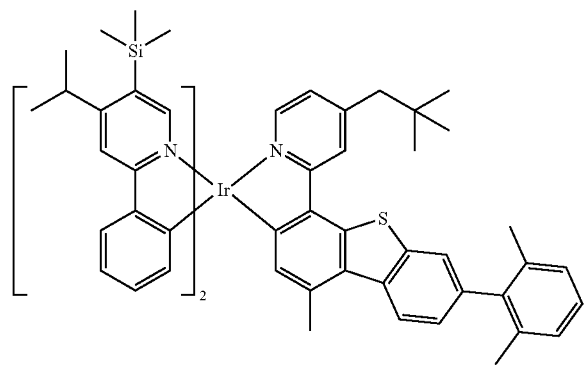
1167
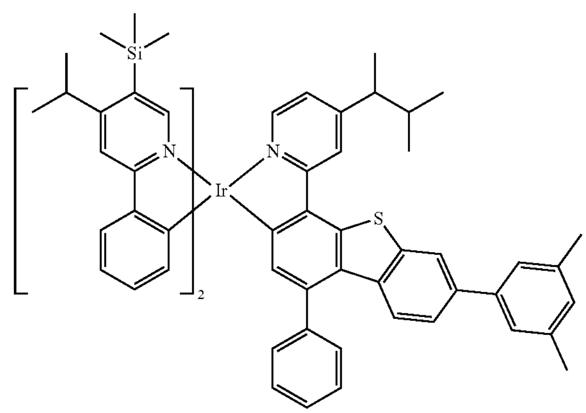
1168
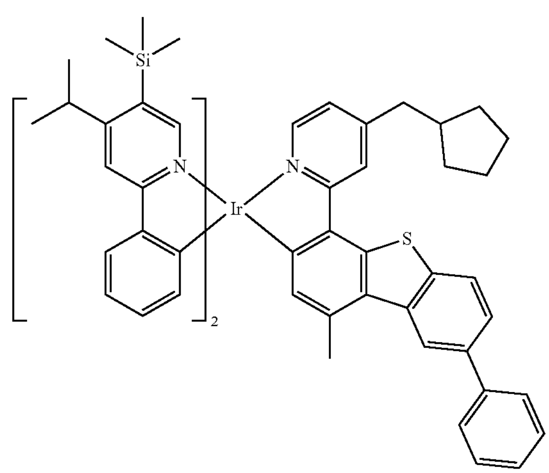

1169
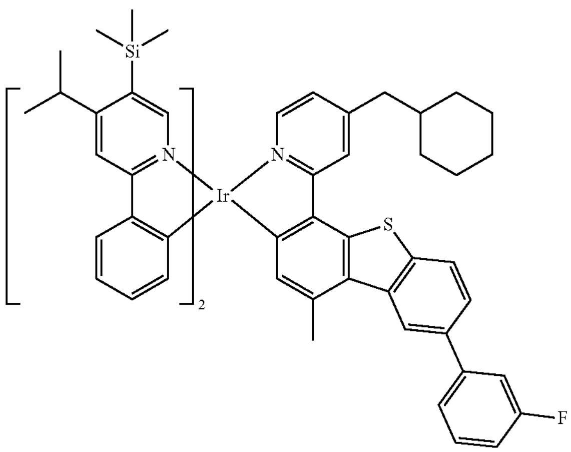
1170
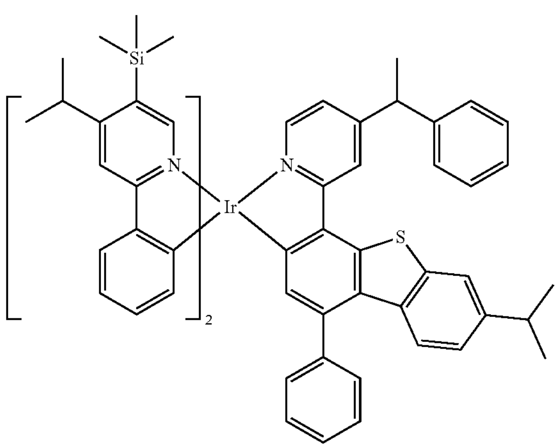
1171
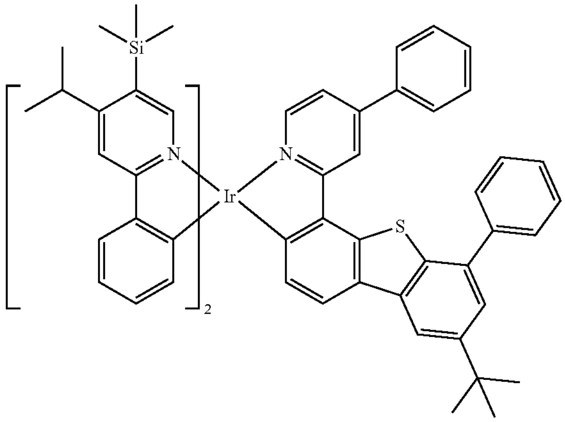
1172
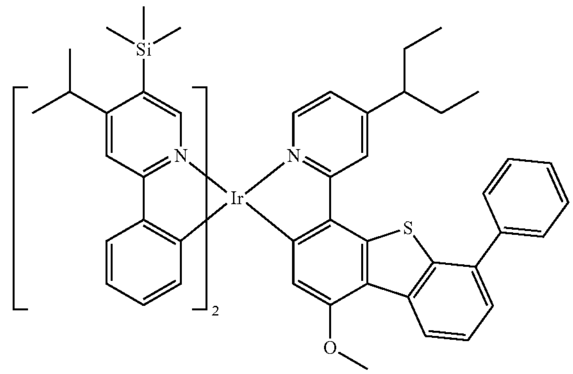
1173
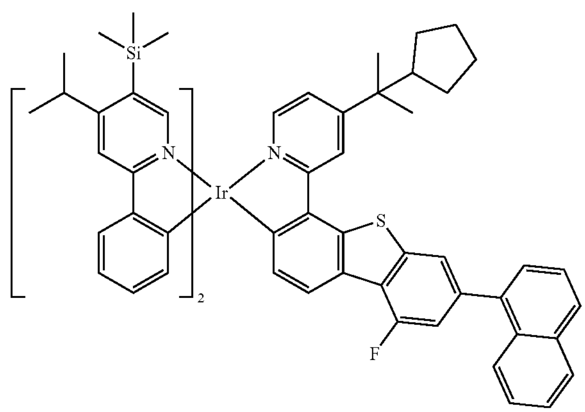
1174
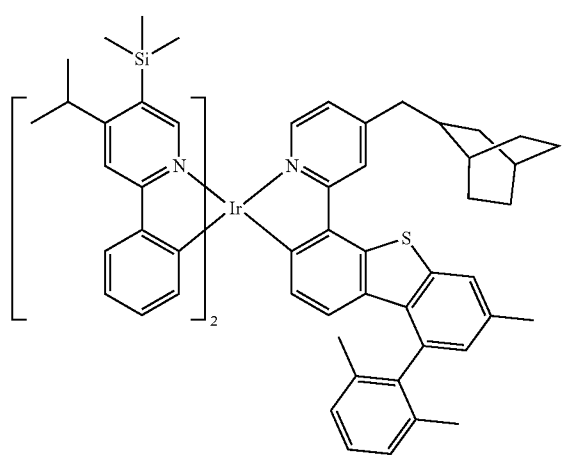

1175
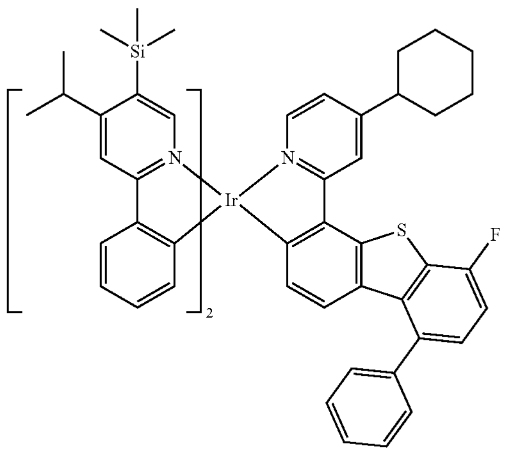
1176
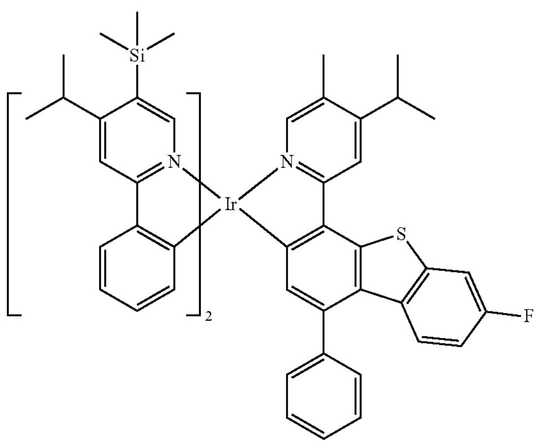
1177
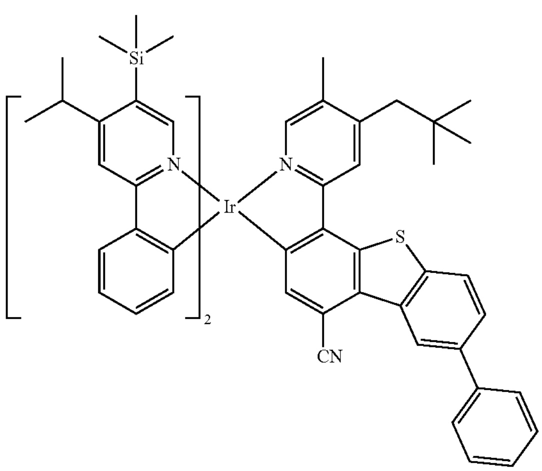
1178
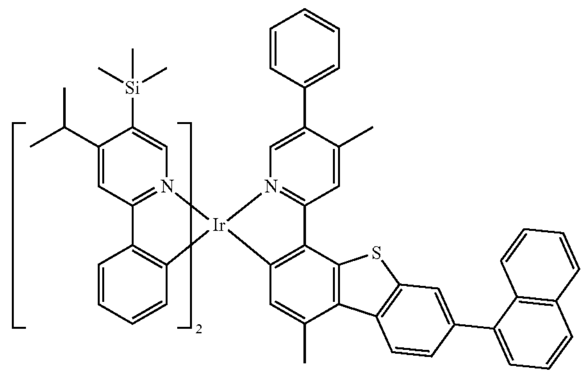
1179
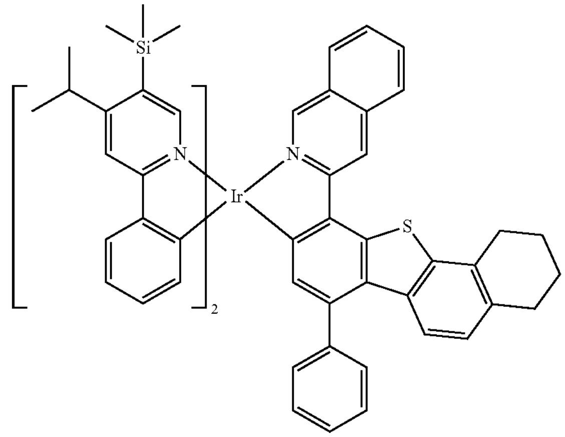
1180
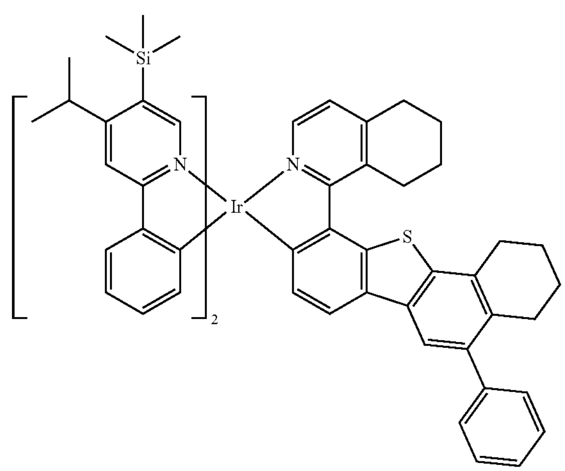

-continued
1181
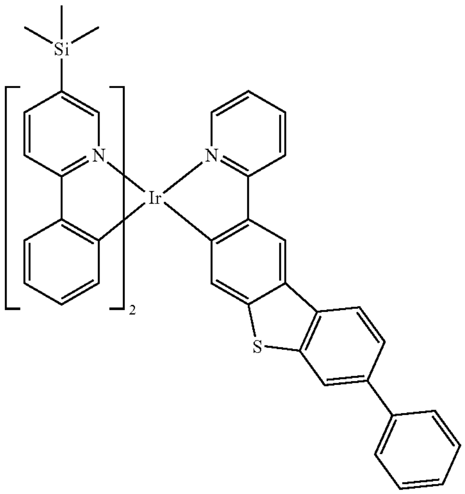
1182
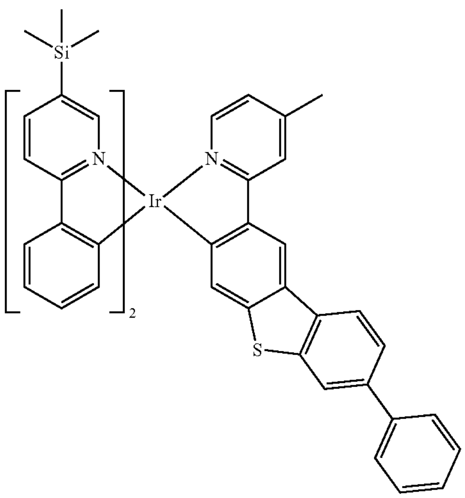
1183
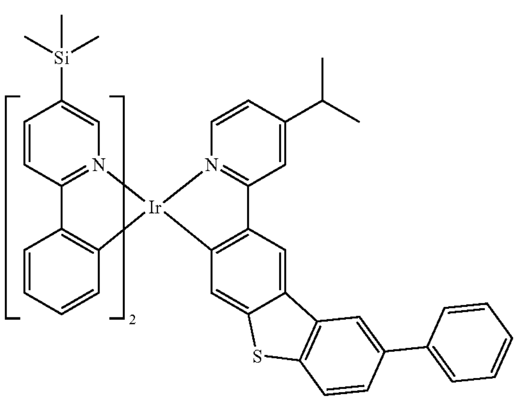
-continued
1184
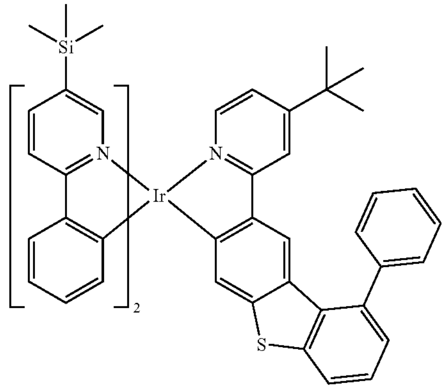
1185
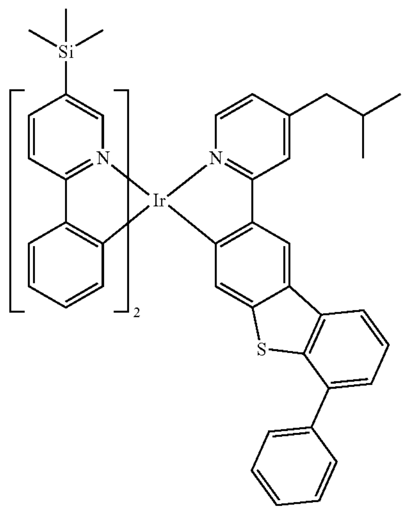
1186
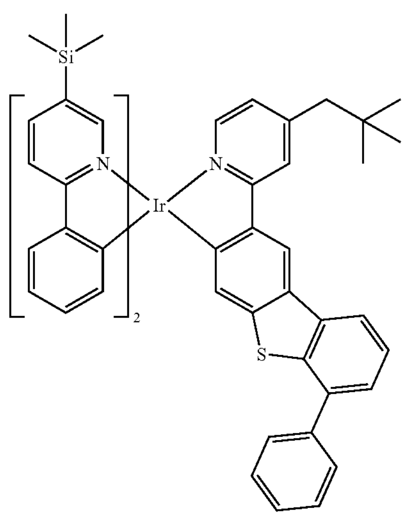

-continued
1187
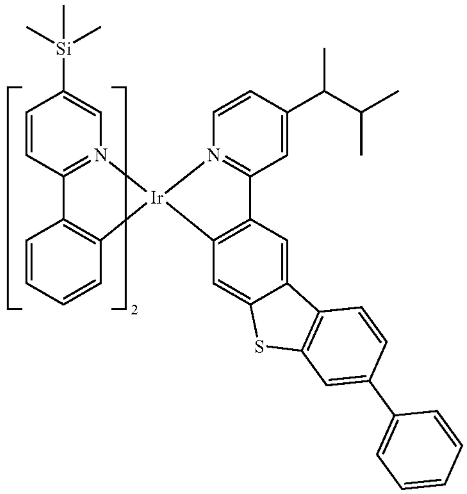
1188
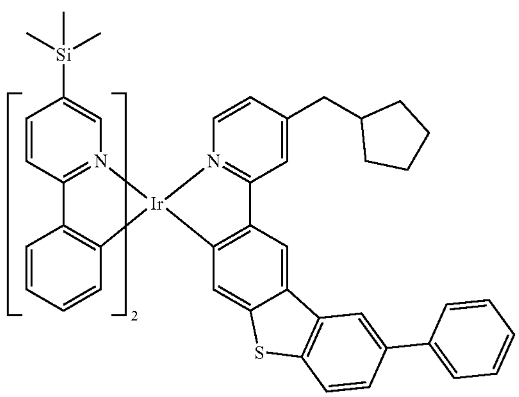
1189
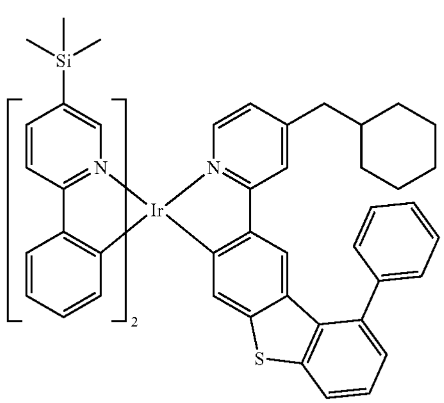
-continued
1190
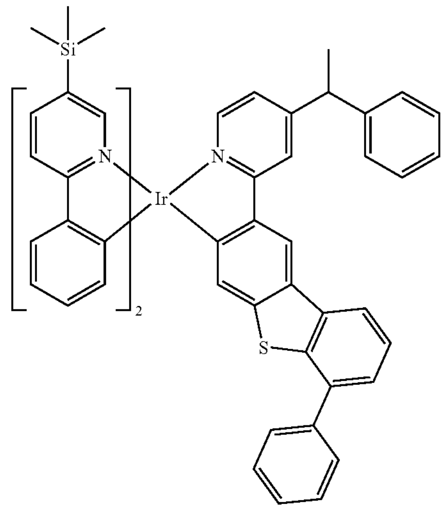
1191
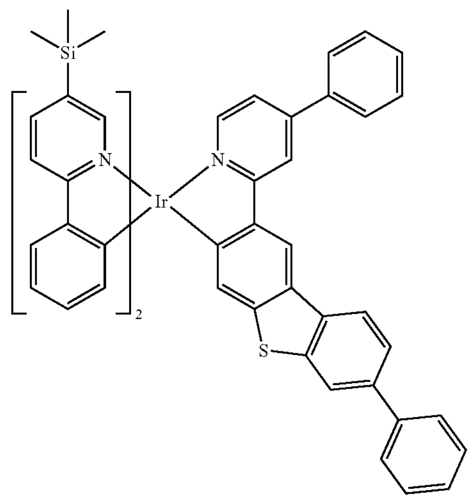
1192
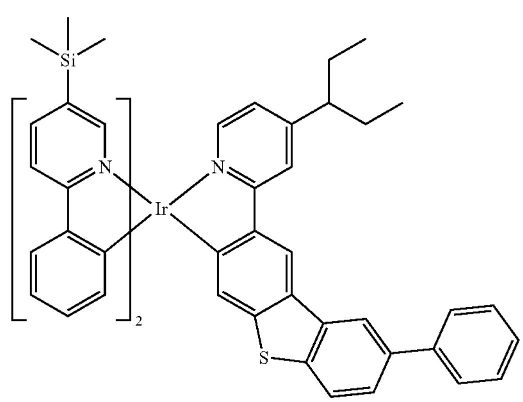

1193
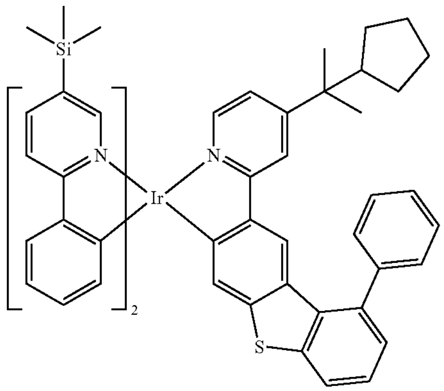
1194
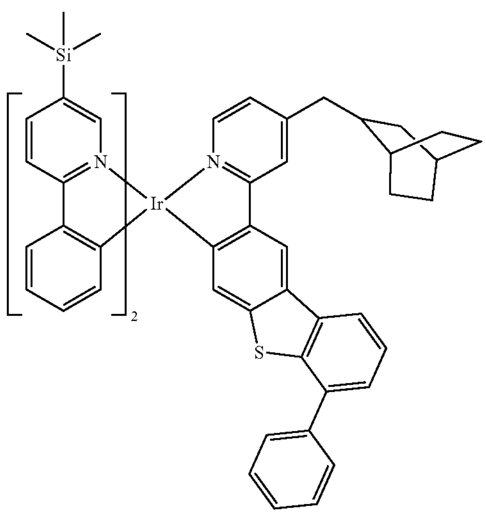
1195
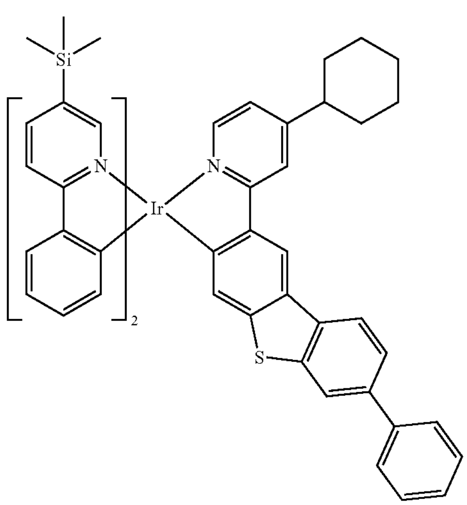
1196
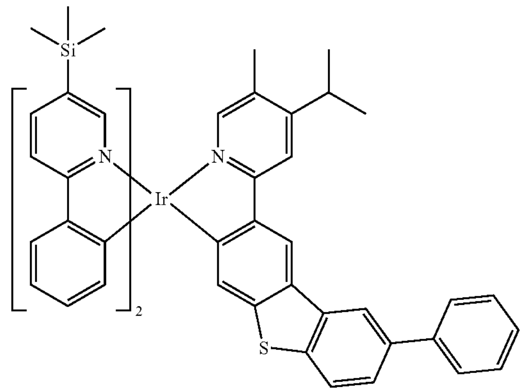
1197
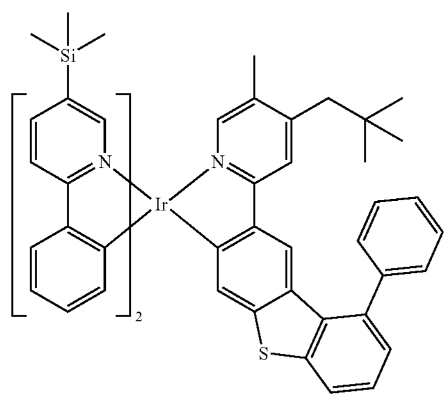
1198
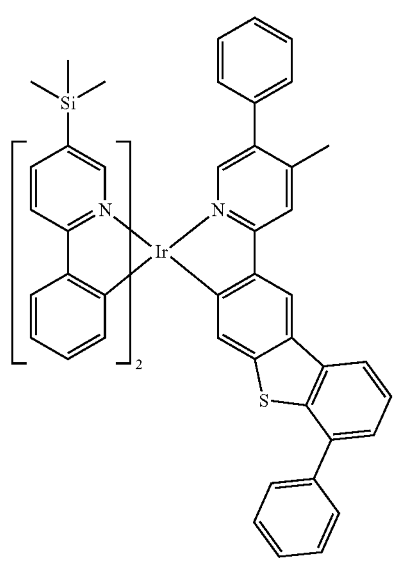

1199
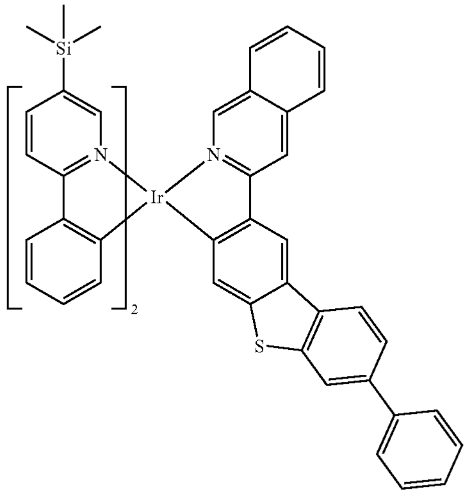
1200
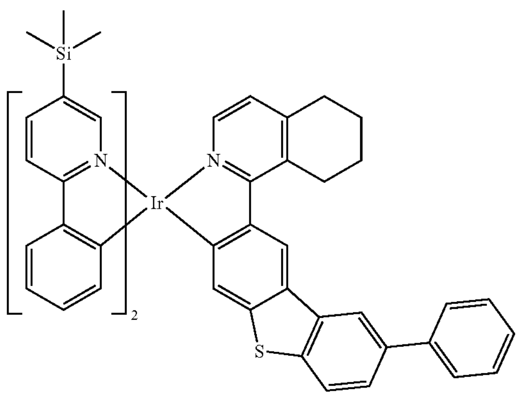
1201
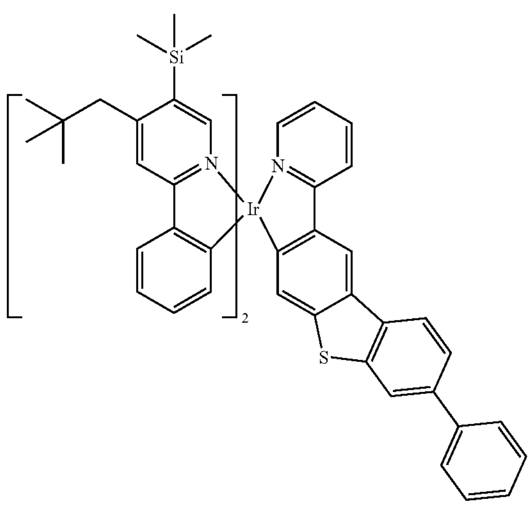
1202
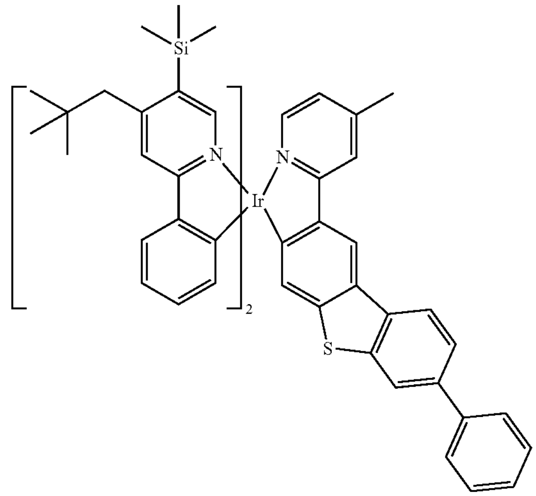
1203
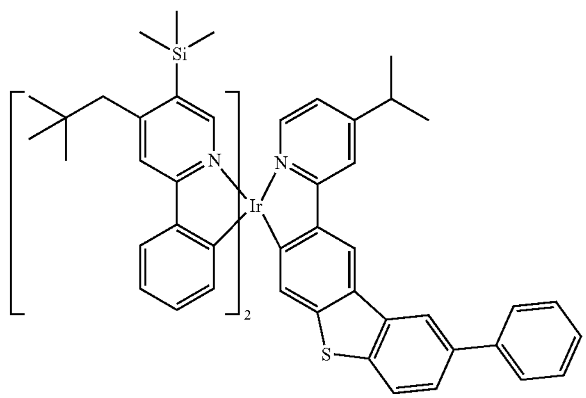
1204
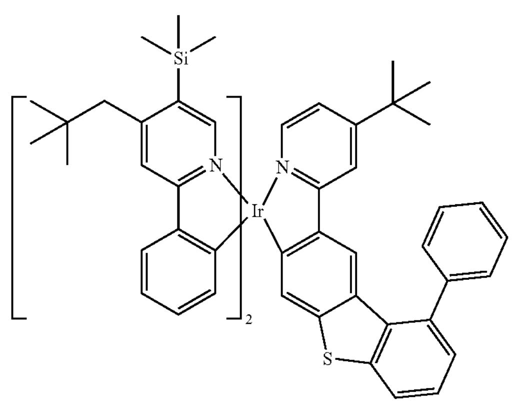

-continued
1205
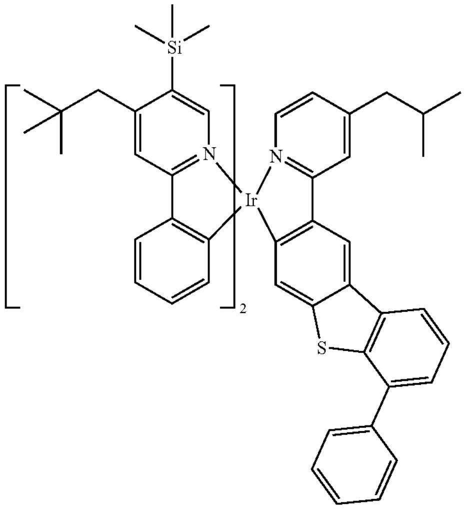
1206
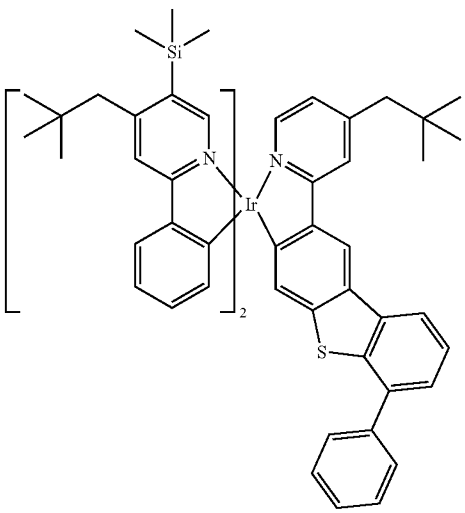
1207
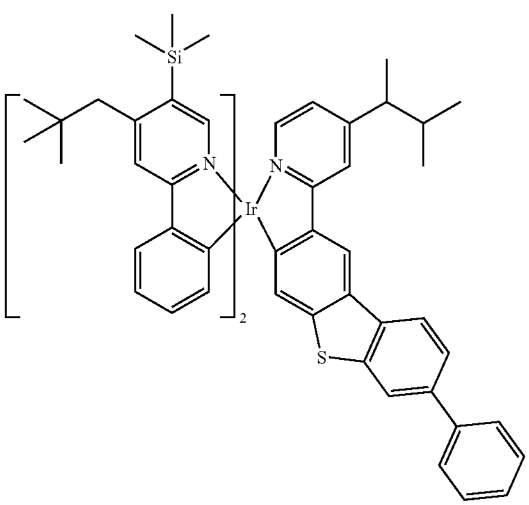
-continued
1208
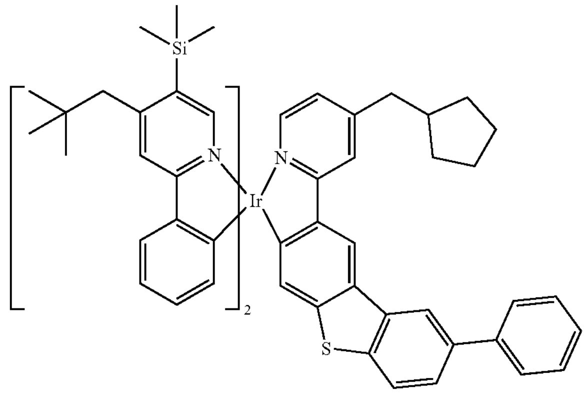
1209
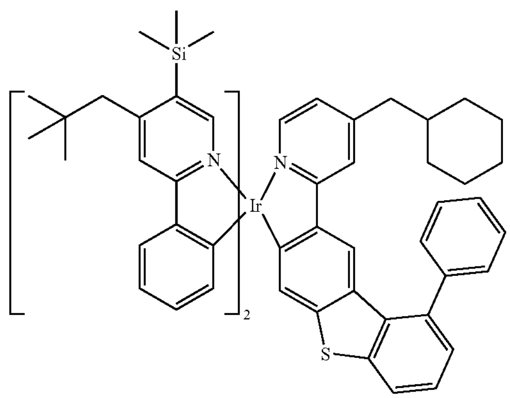
1210
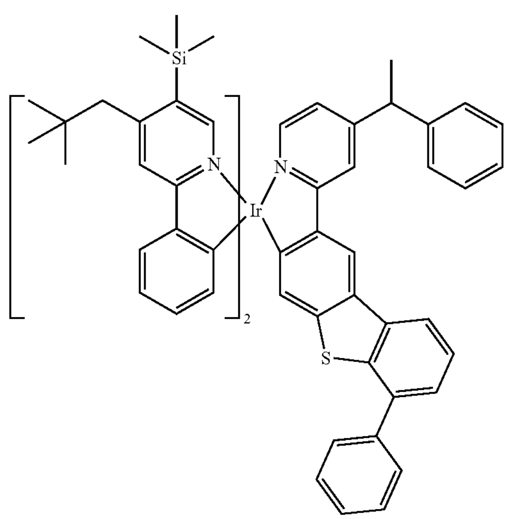

1211
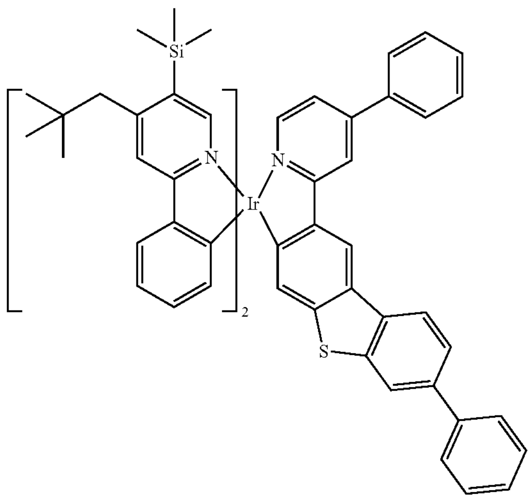
1212
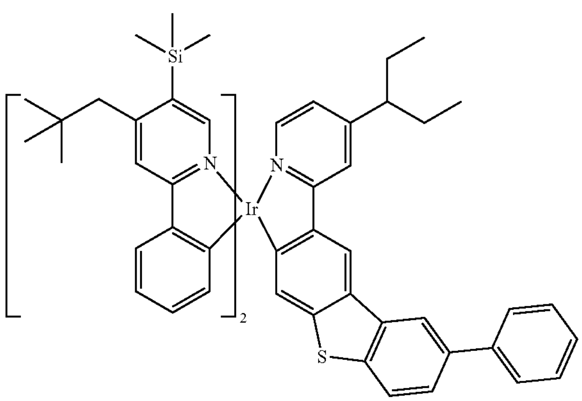
1213
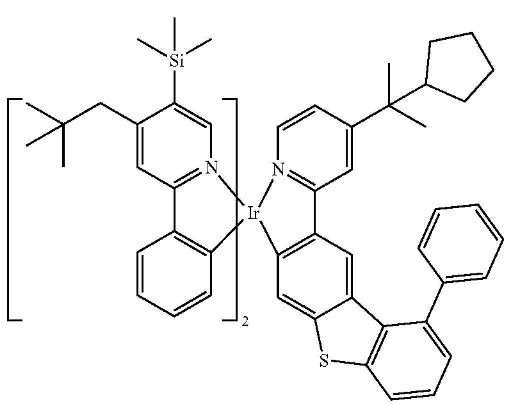
1214
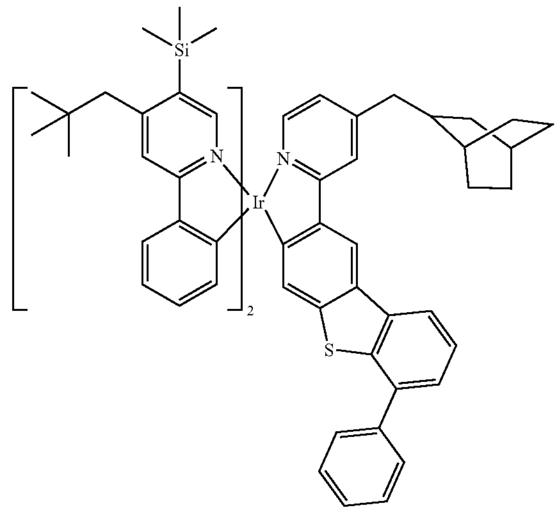
1215
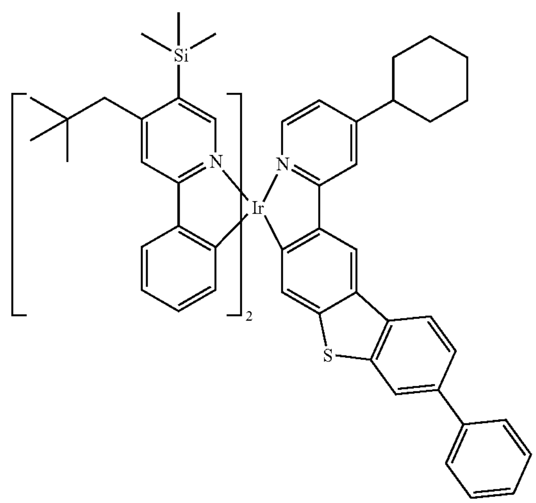
1216
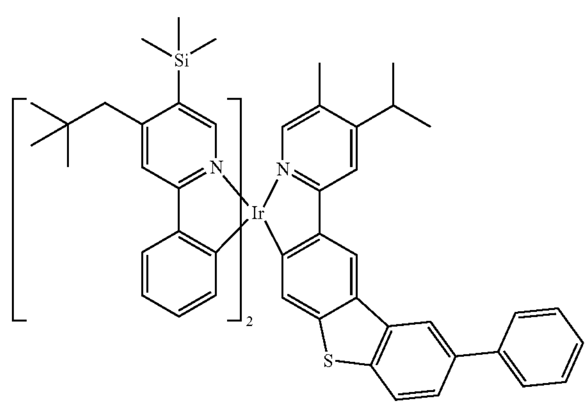

-continued
1217
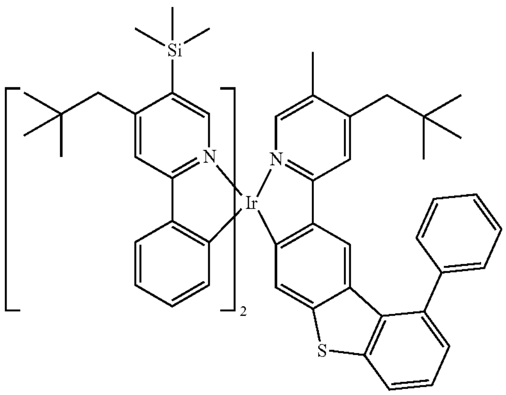
1218
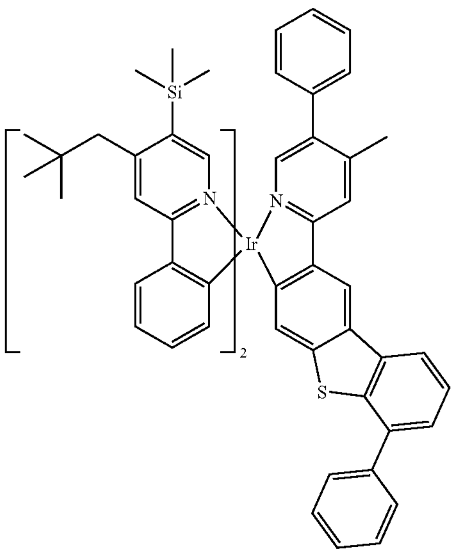
1219
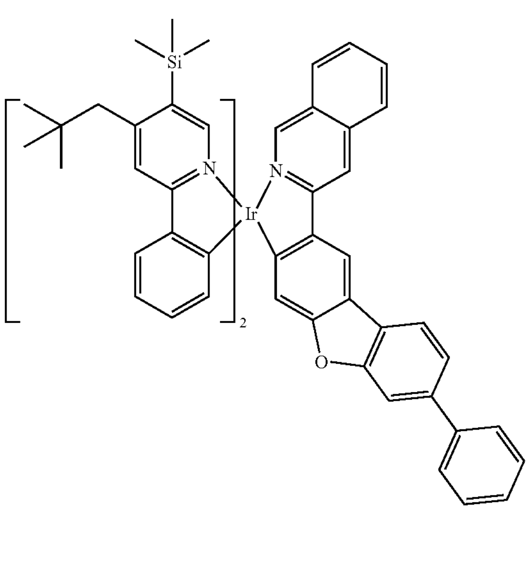
-continued
1220
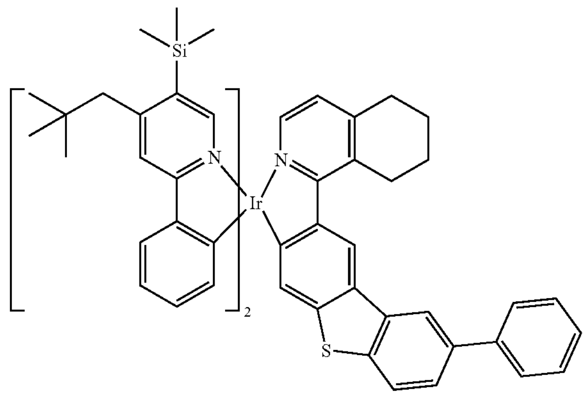
1221
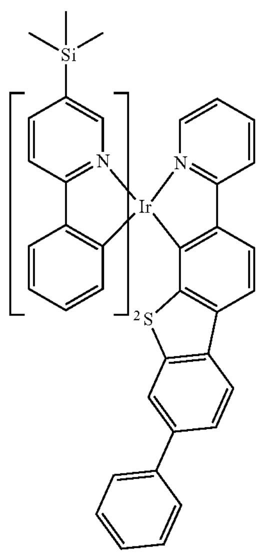
1222
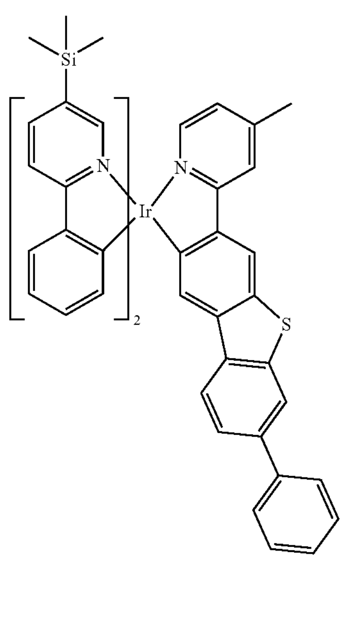

-continued
1223
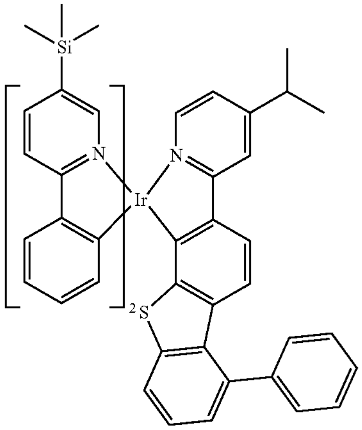
1224
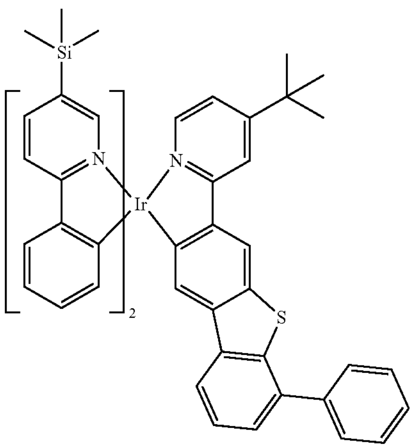
1225
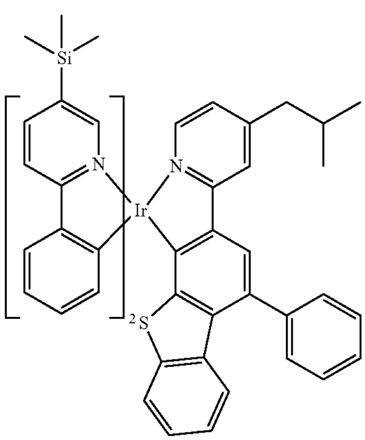
-continued
1226
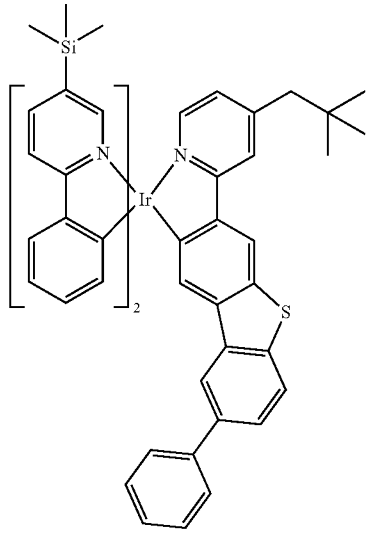
1227
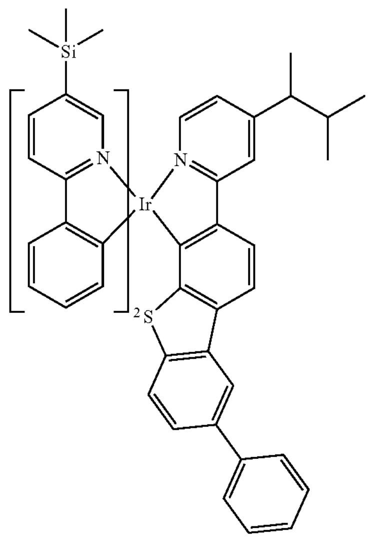
1228
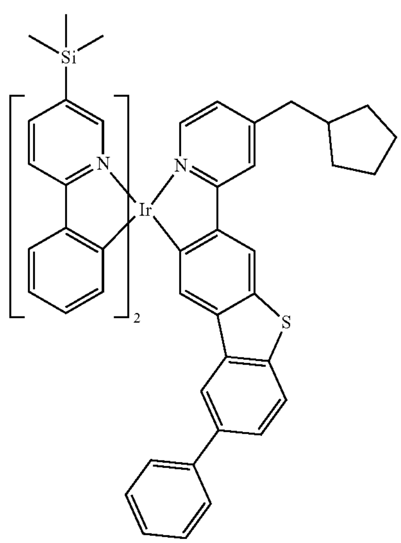

-continued
1229
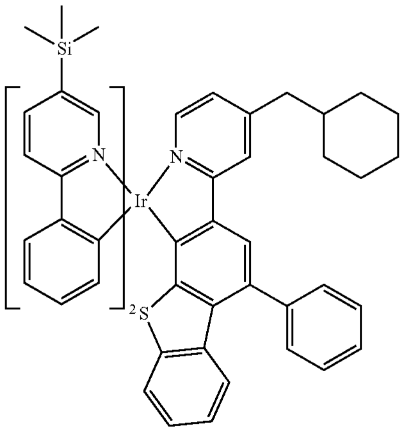
1230
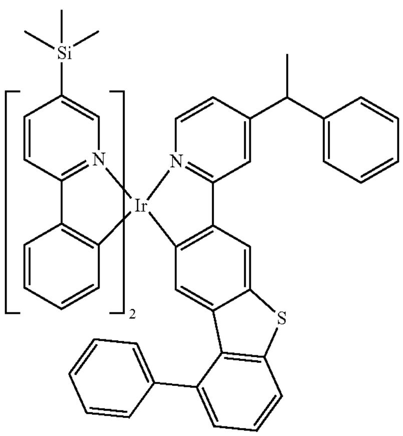
1231
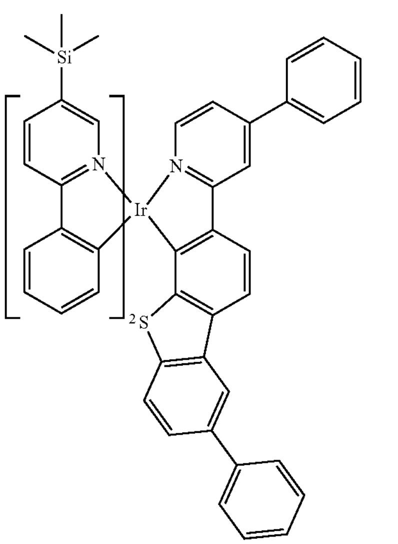
-continued
1232
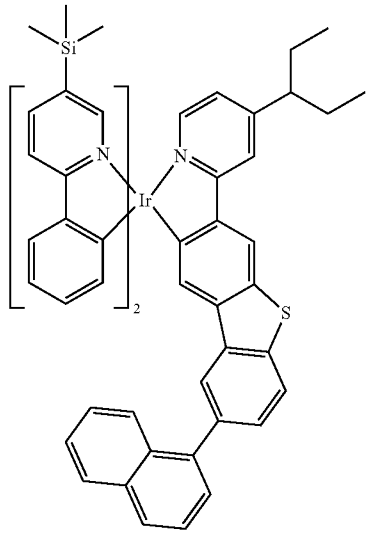
1233
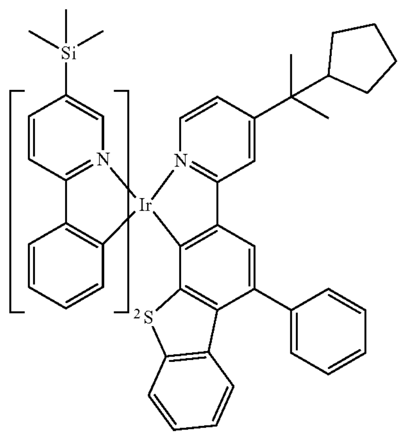
1234
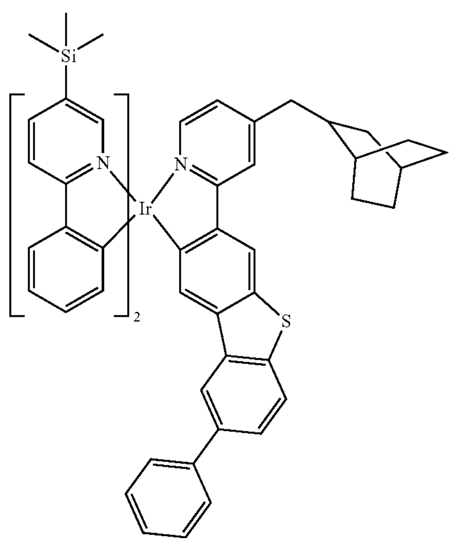

1235
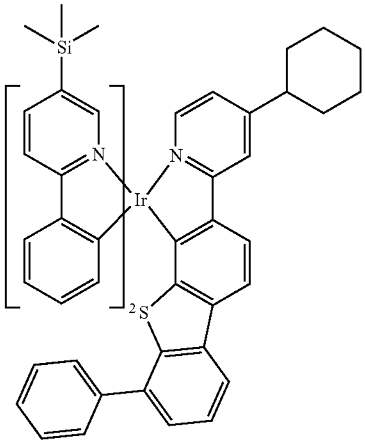
1236
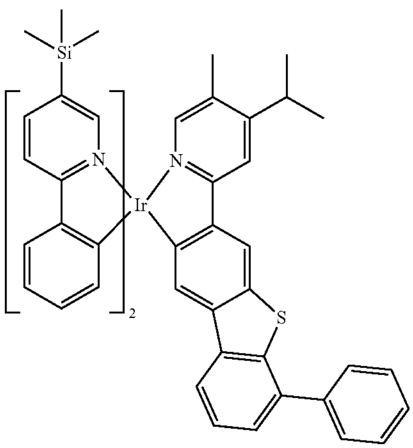
1237
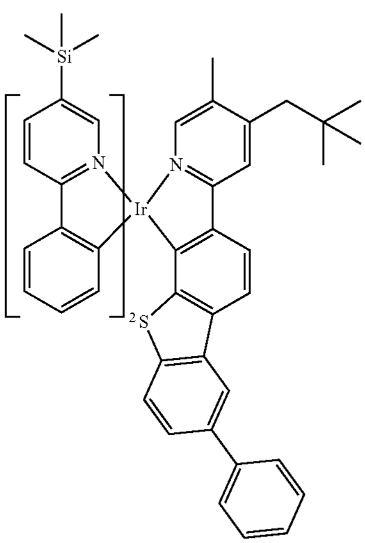
1238
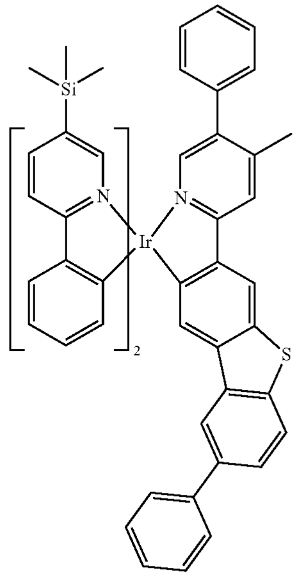
1239
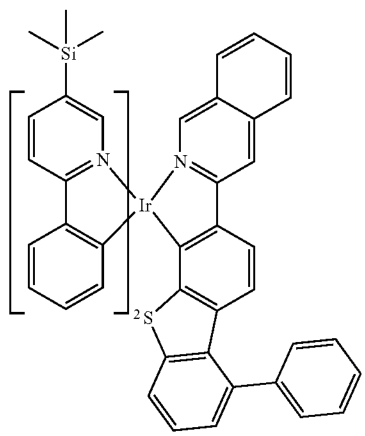
1240
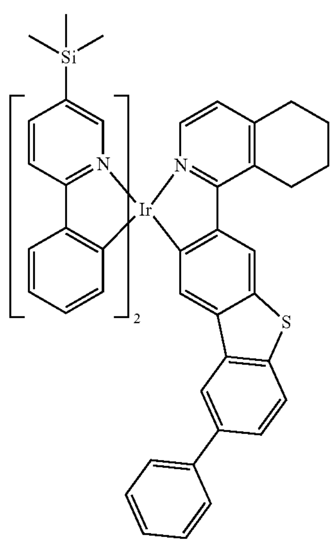

-continued
1241
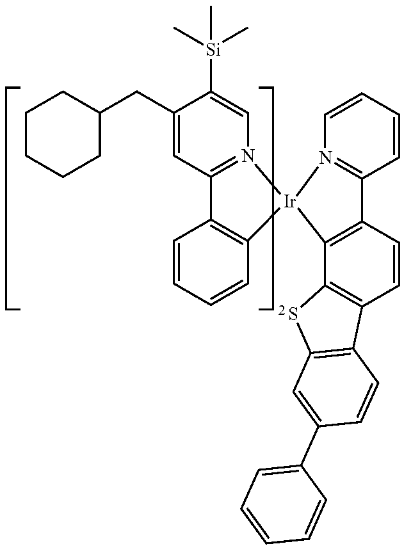
1242
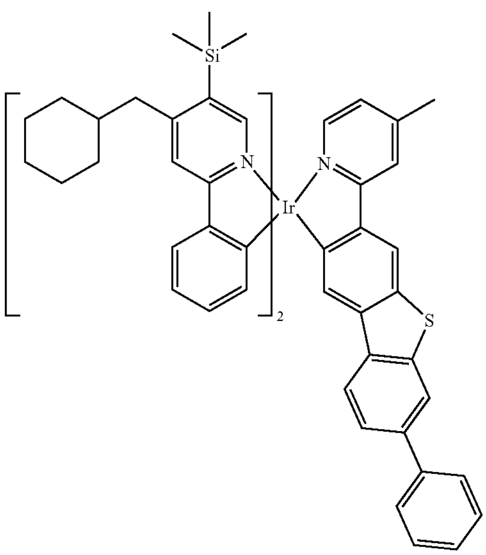
1243
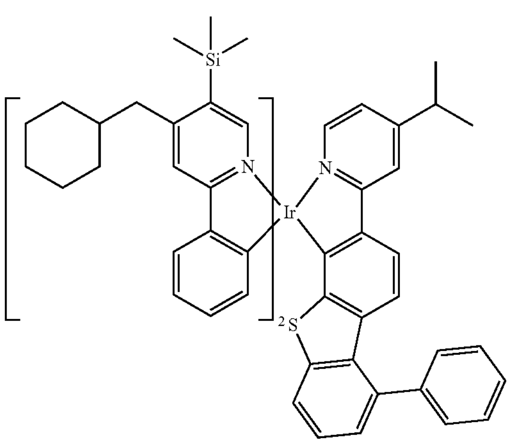
-continued
1244
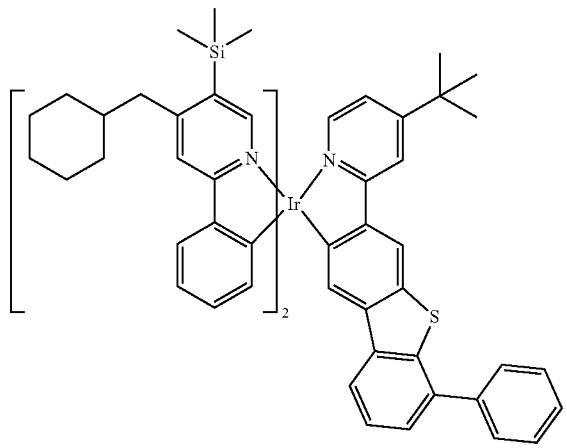
1245
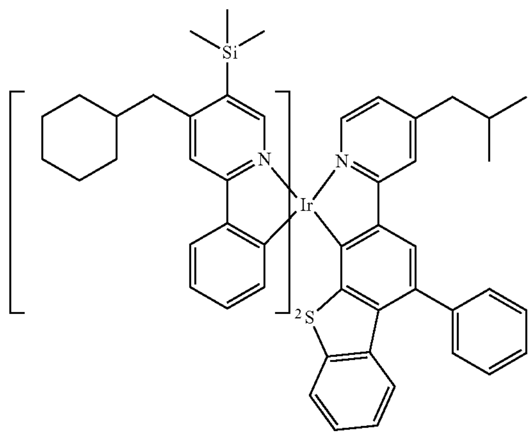
1246
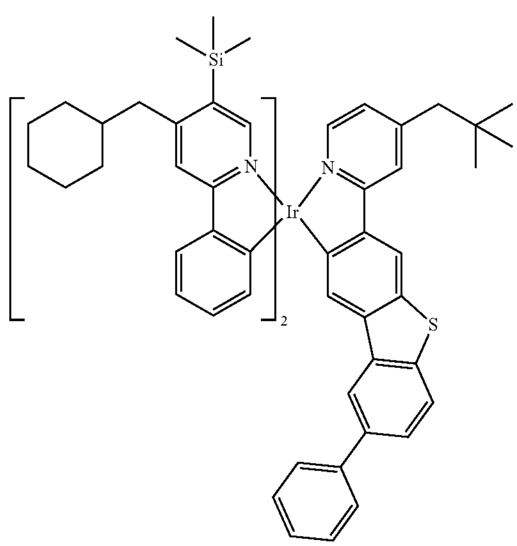

-continued
1247
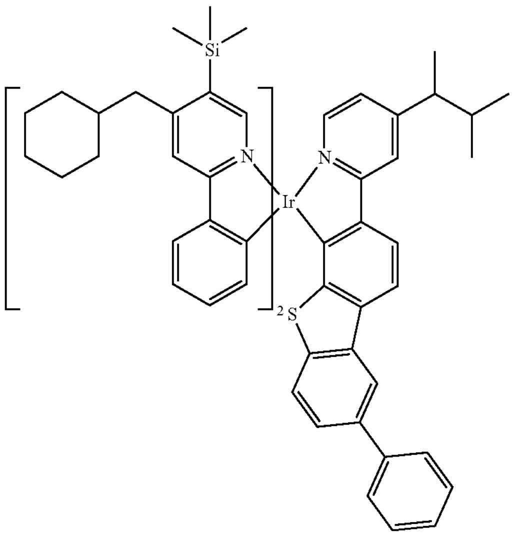
1248
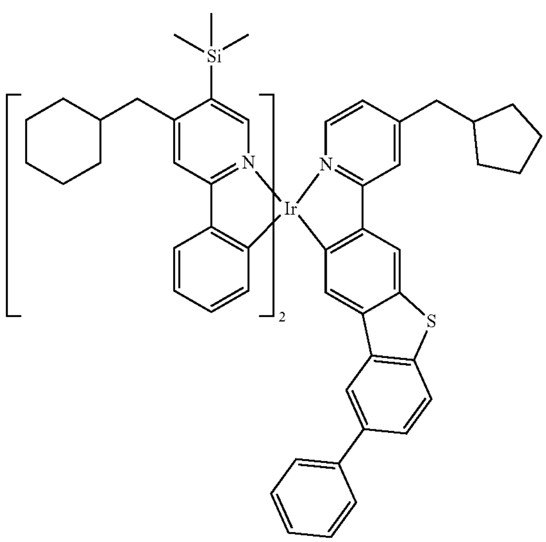
1249
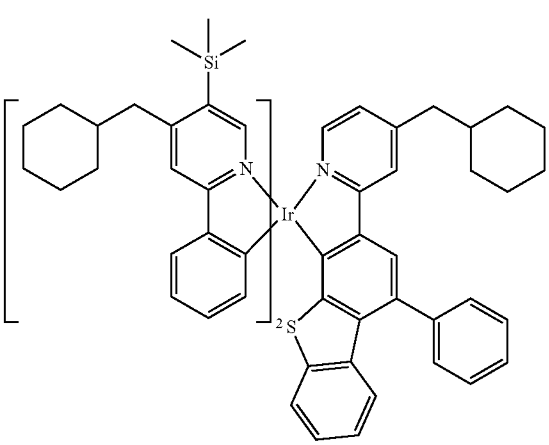
-continued
1250
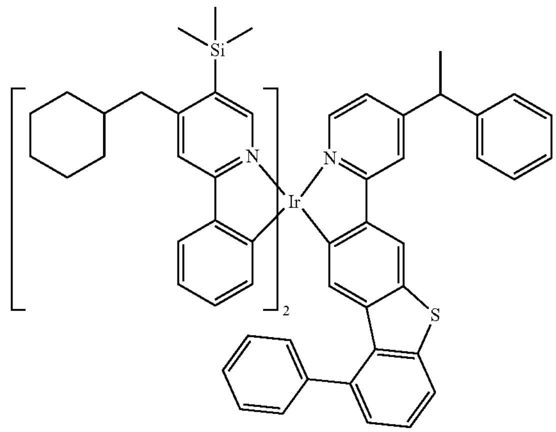
1251
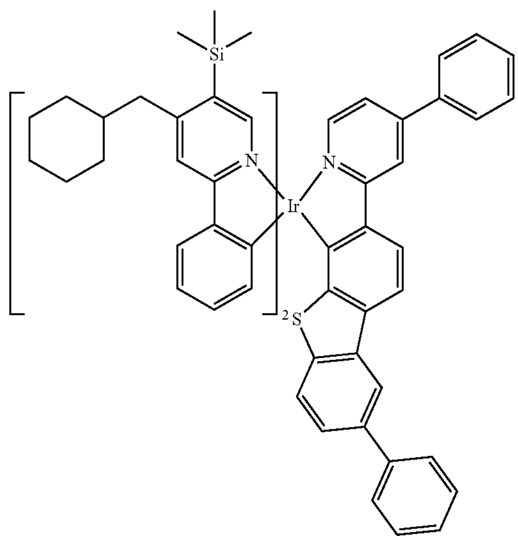
1252
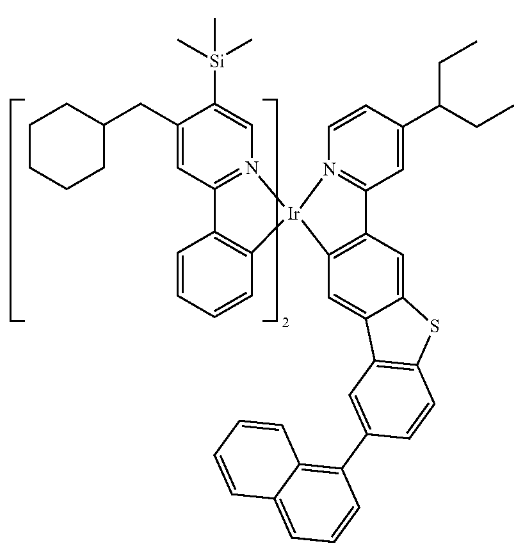

-continued
1253
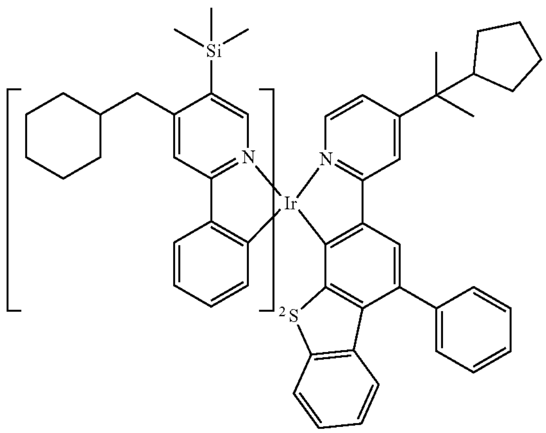
1254
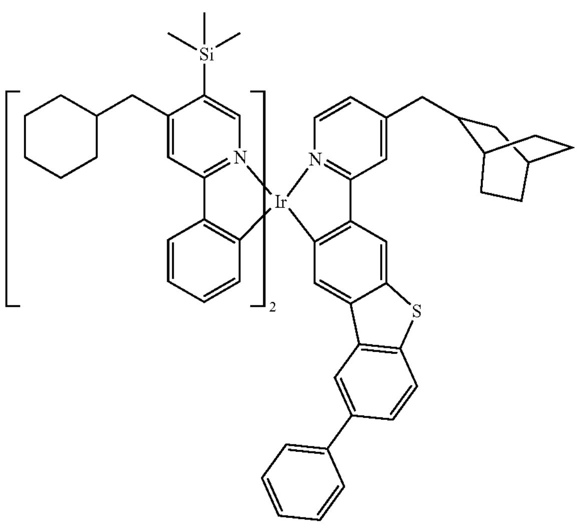
1255
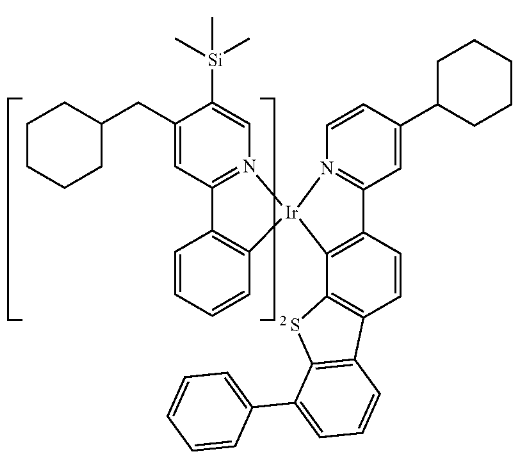
-continued
1256
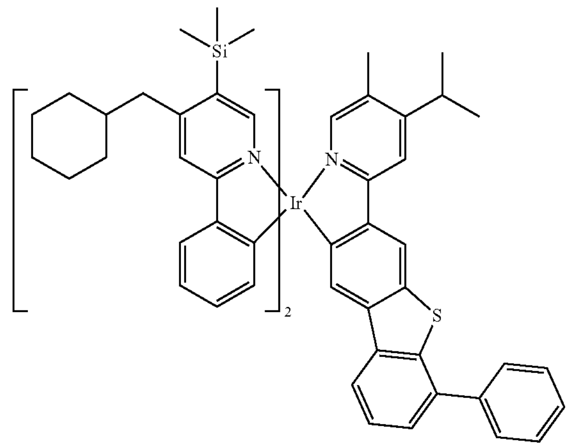
1257
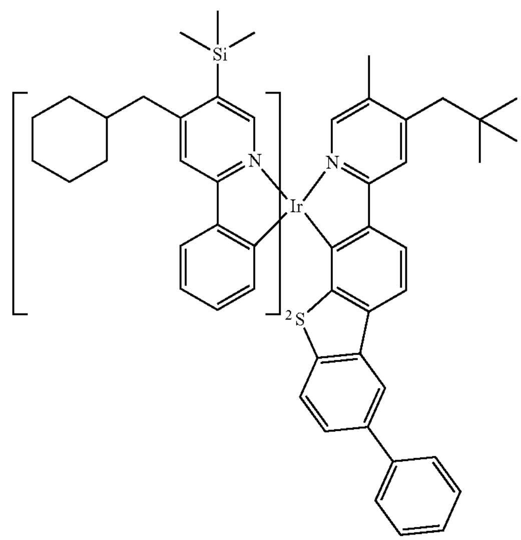
1258
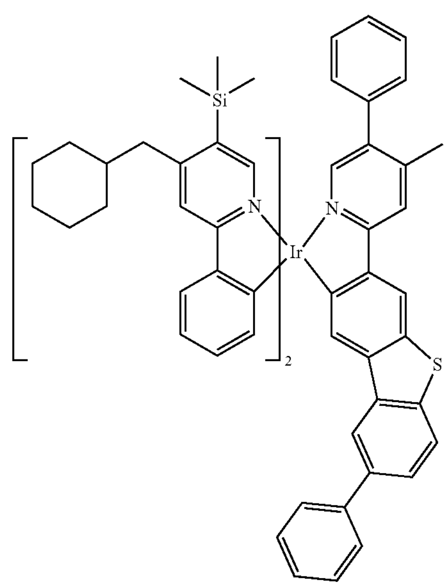

-continued
1259
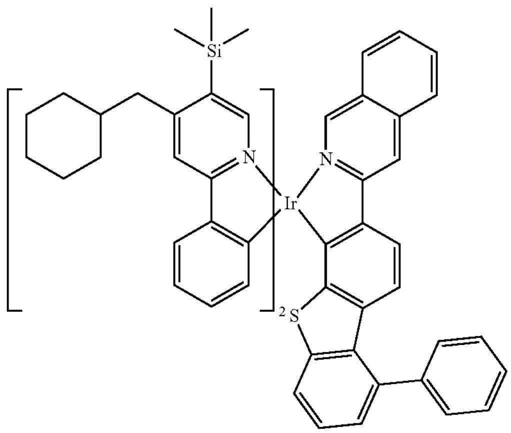
1260
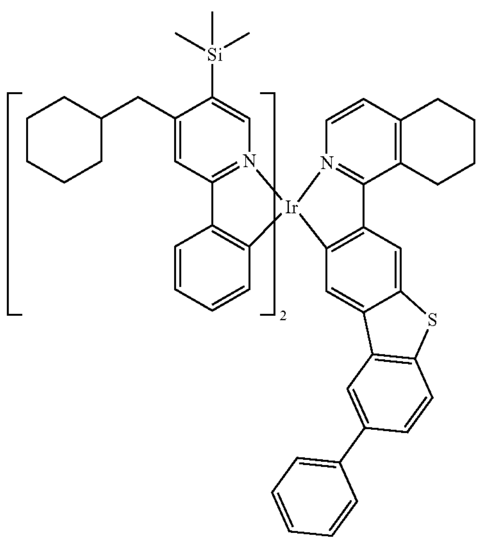
1261
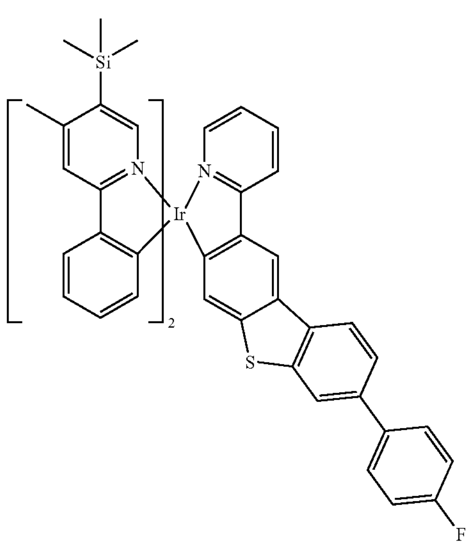
1262
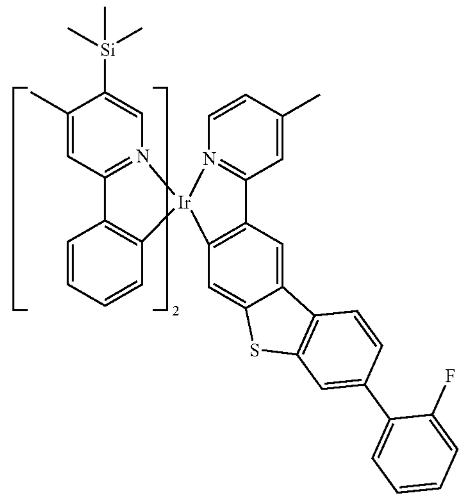
1263
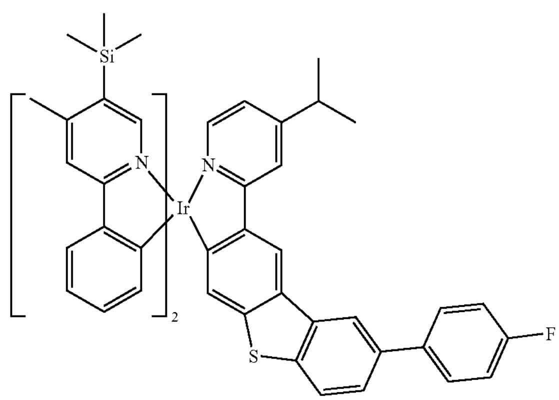
1264
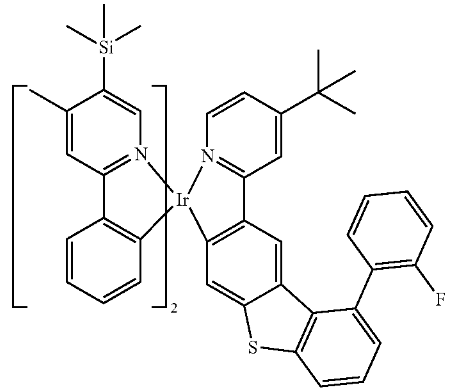

-continued
1265
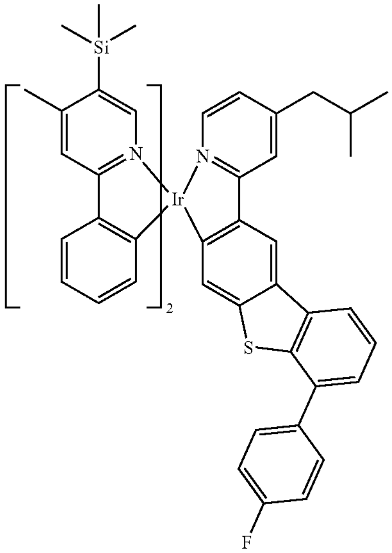
1266
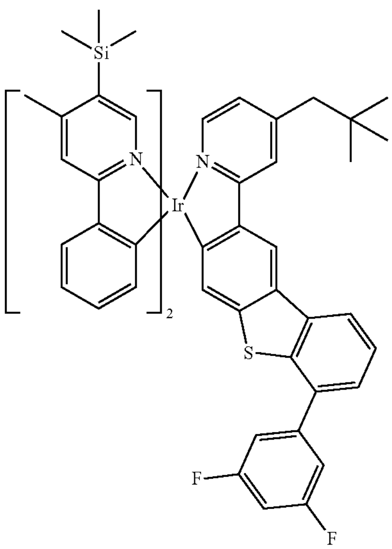
1267
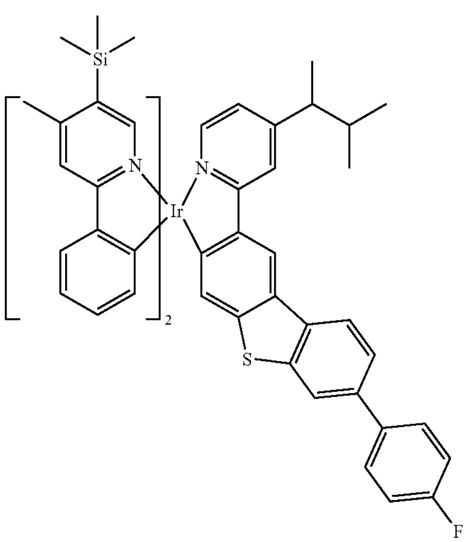
-continued
1268
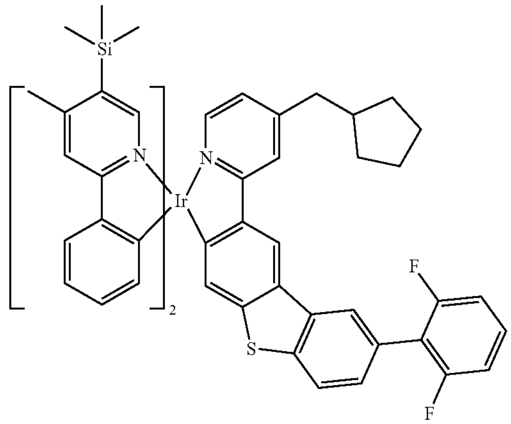
1269
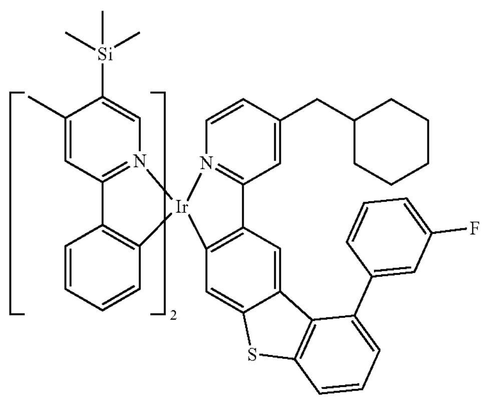
1270
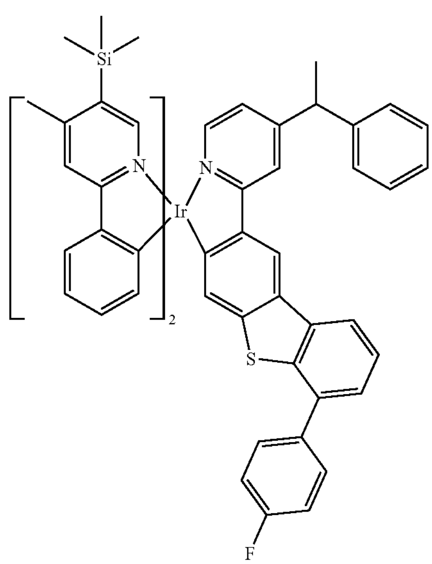

1271
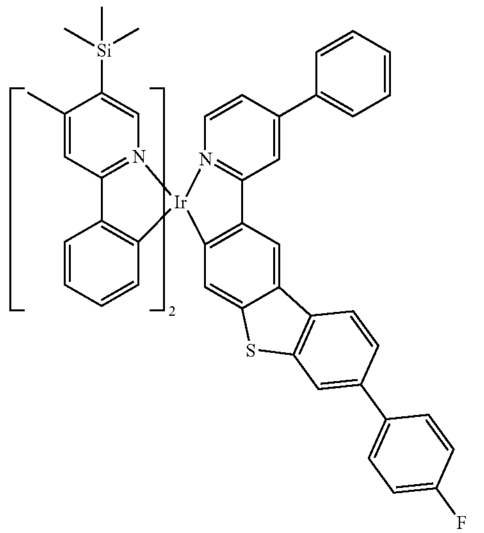
1272
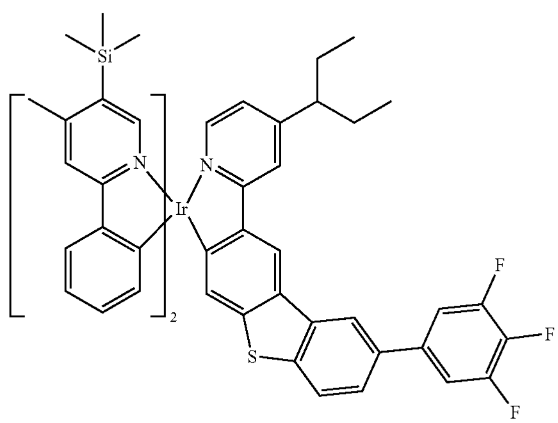
1273
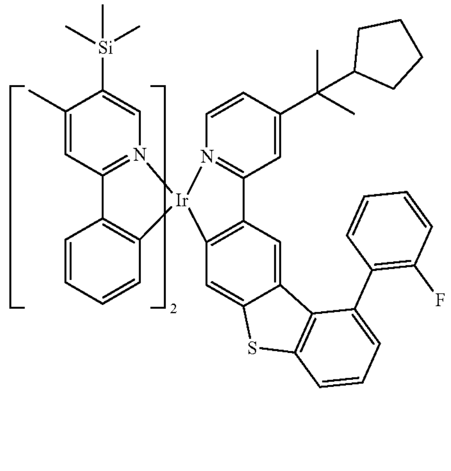
1274
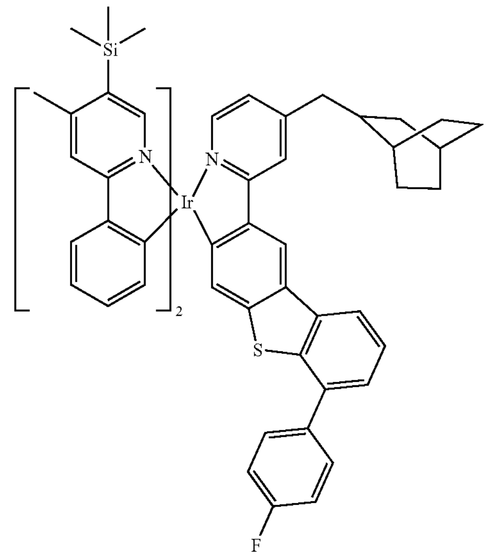
1275
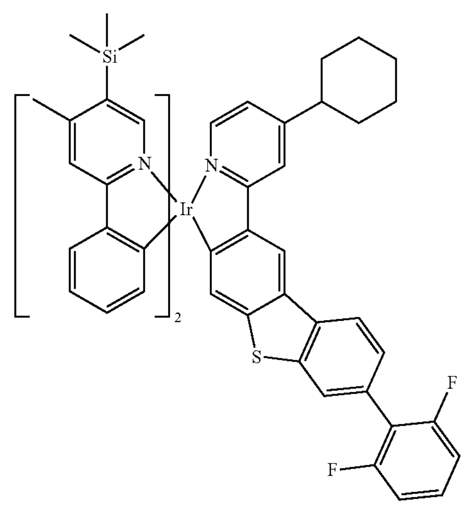
1276
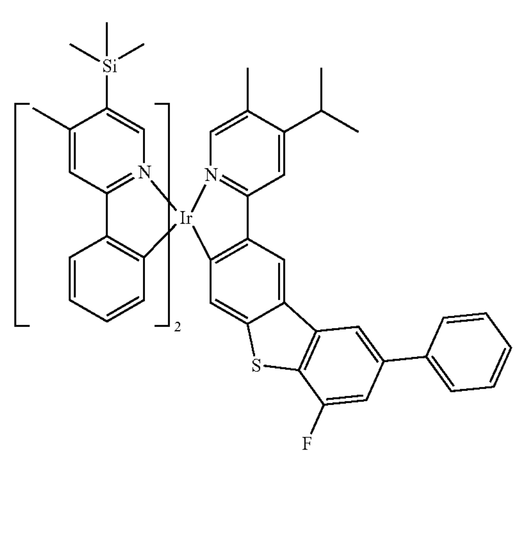

-continued
1277
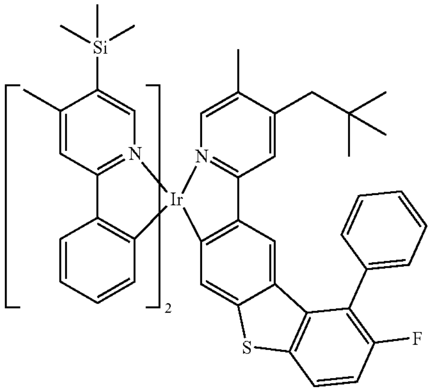
1278
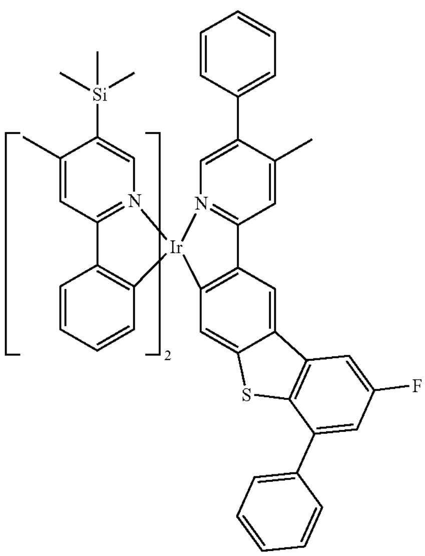
1279
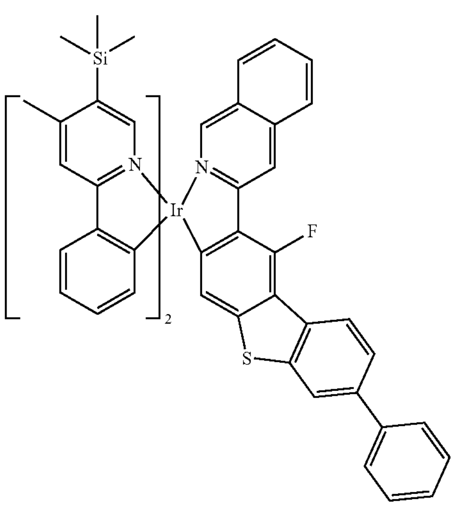
-continued
1280
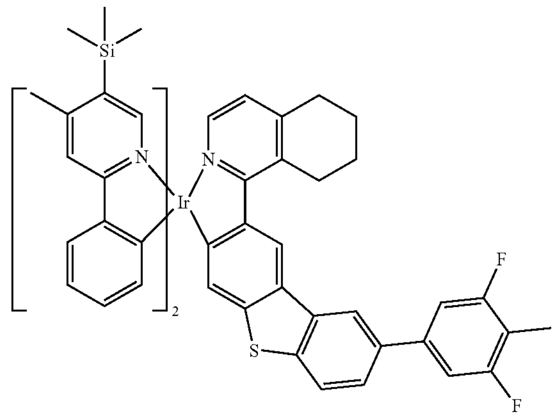
1281
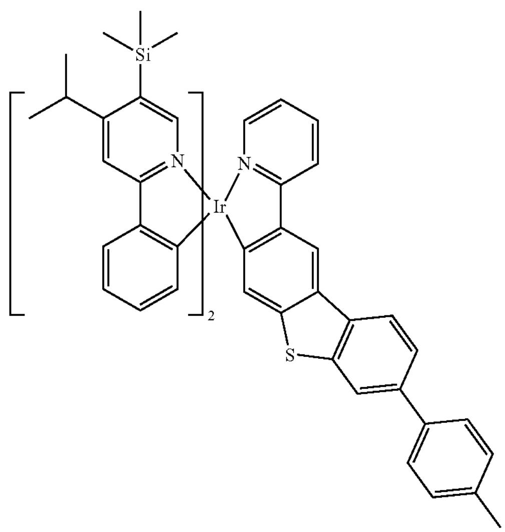
1282
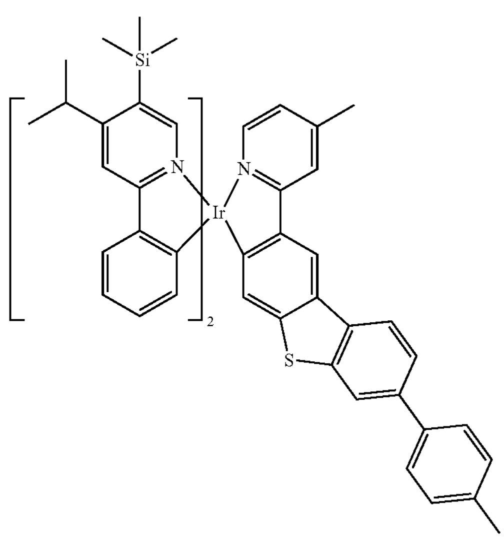

1283
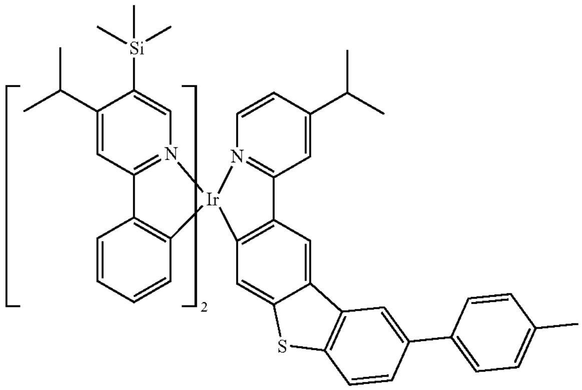
1284
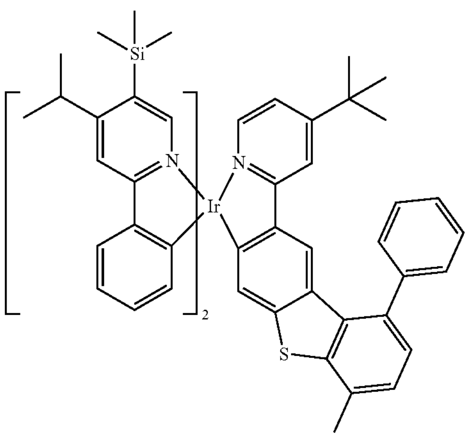
1285
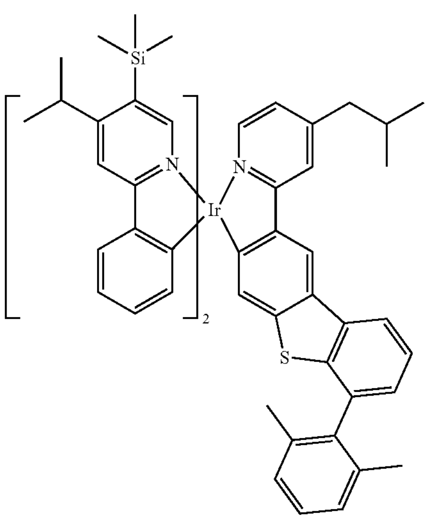
1286
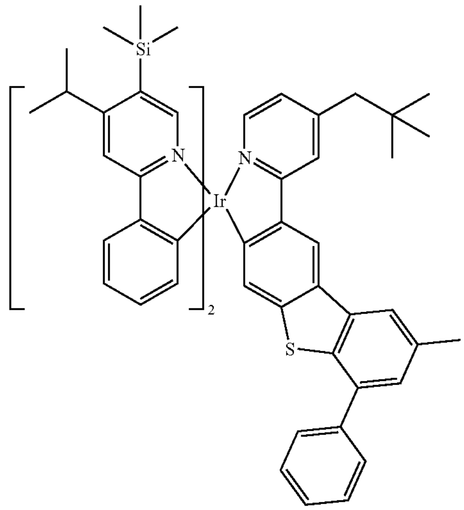
1287
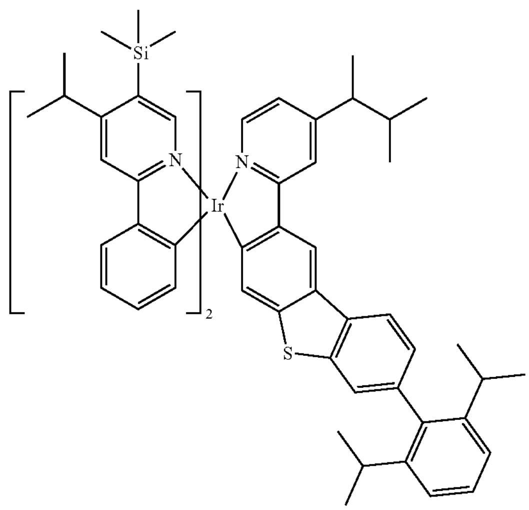
1288
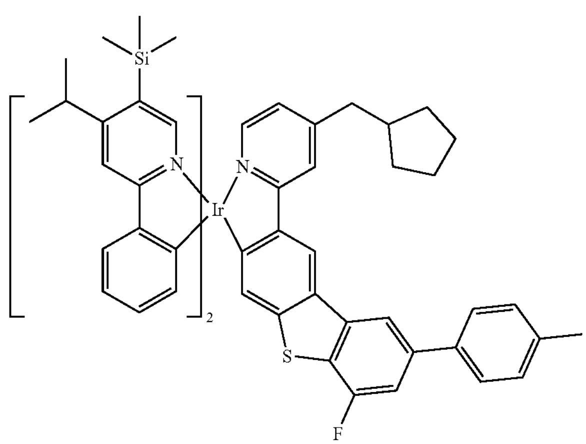

-continued
1289
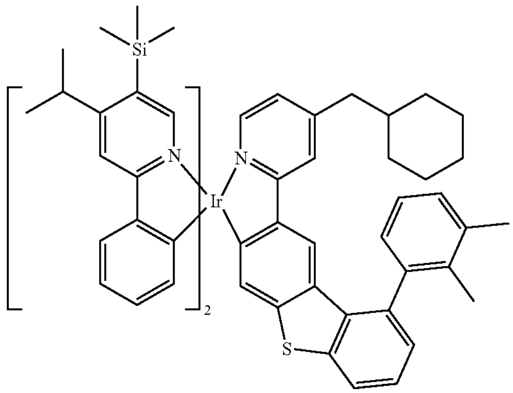
1290
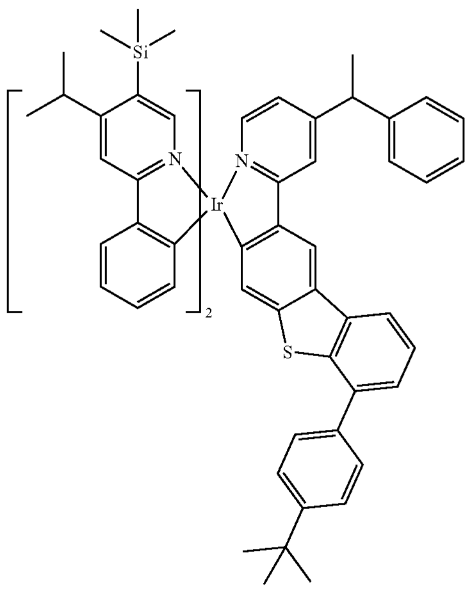
1291
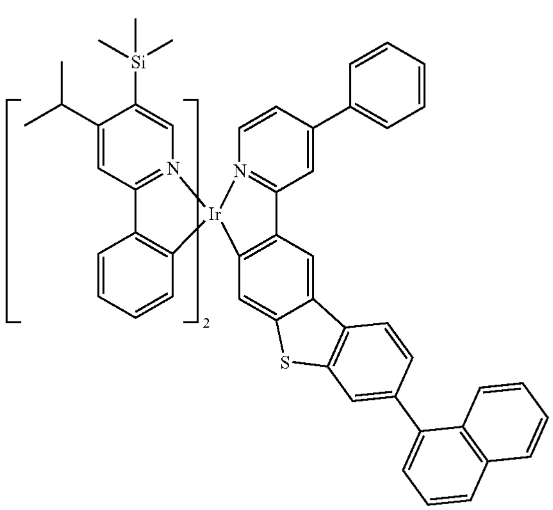
-continued
1292
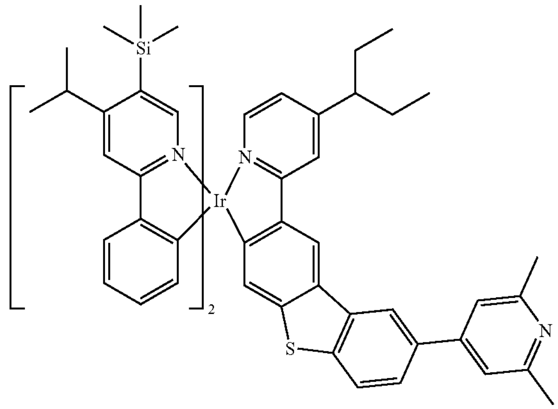
1293
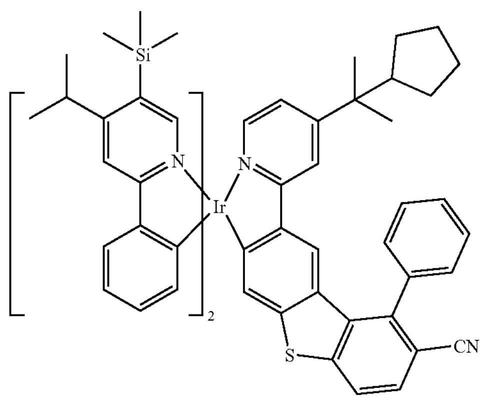
1294
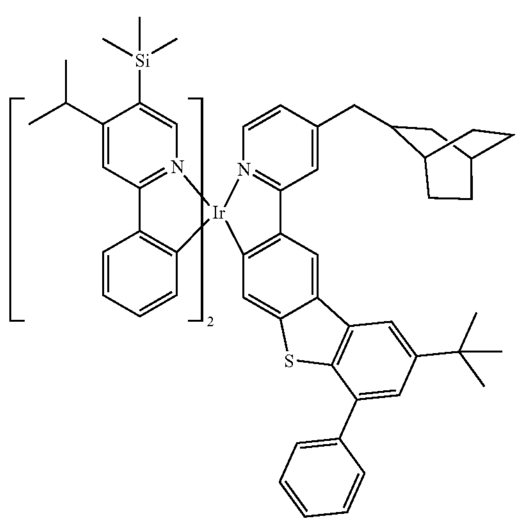

-continued
1295
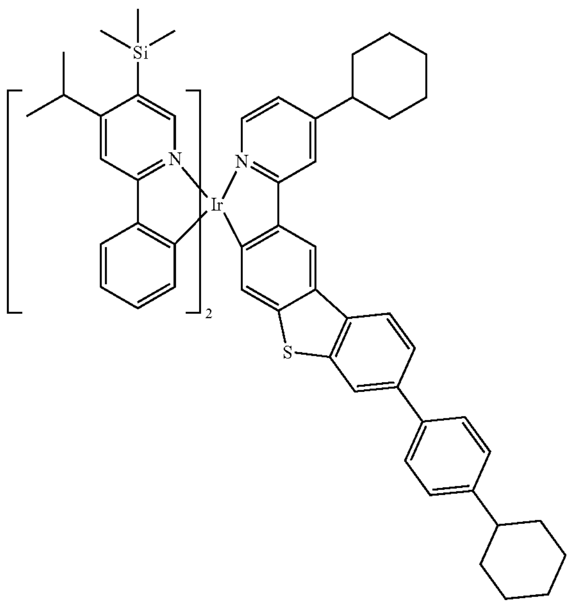
1296
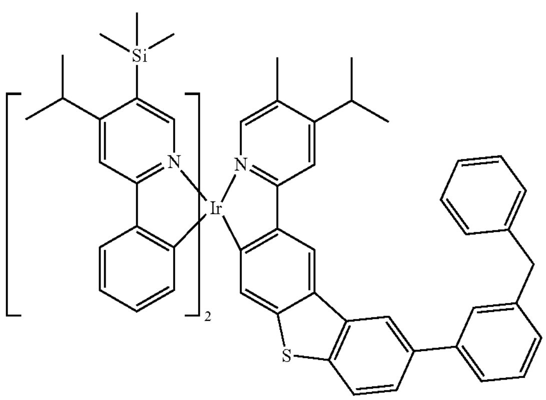
1297
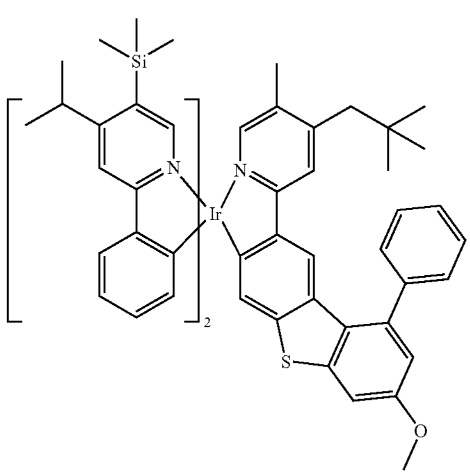
-continued
1298
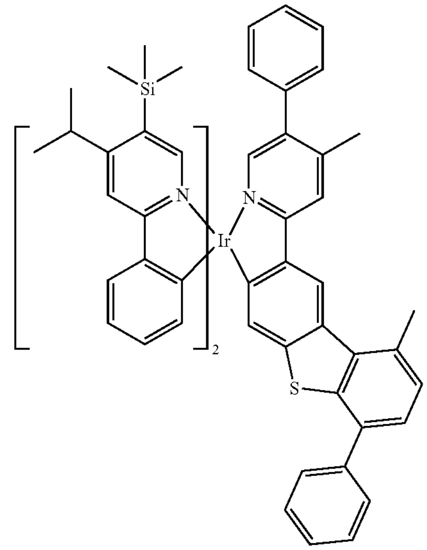
1299
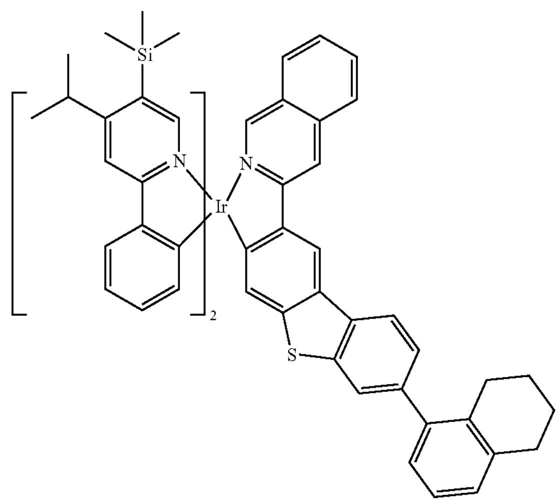
1300
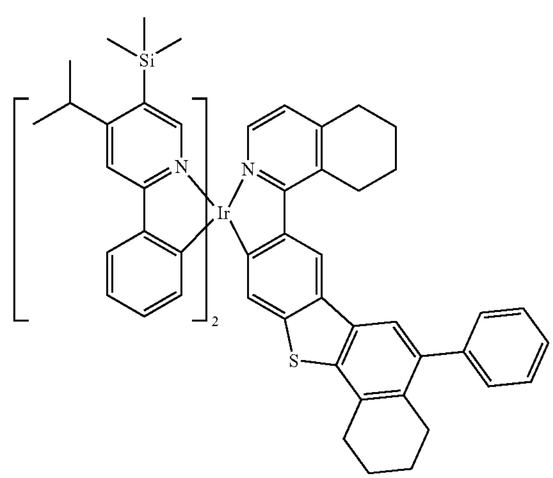

-continued
1301
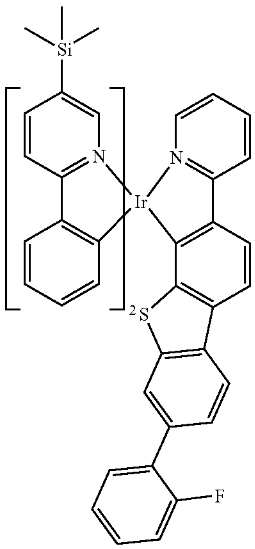
1302
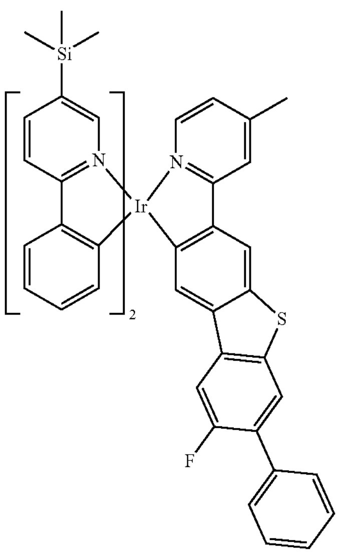
1303
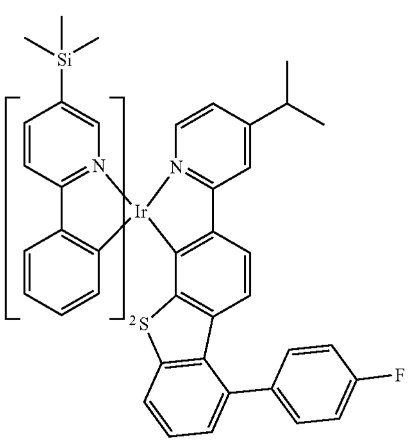
-continued
1304
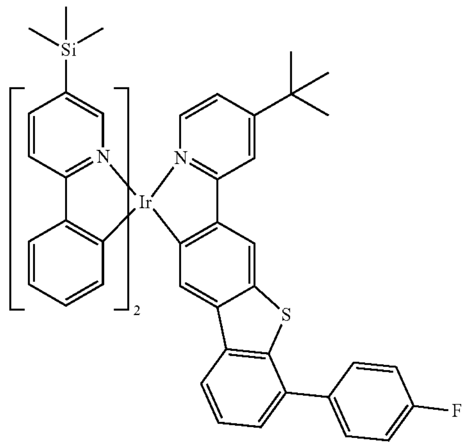
1305
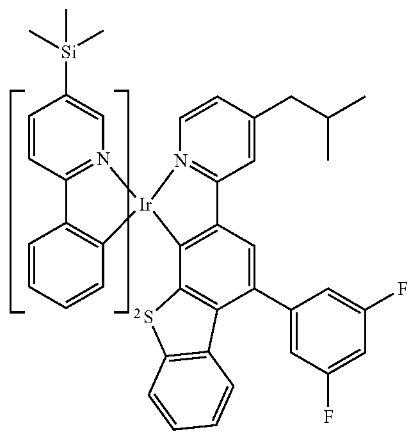
1306
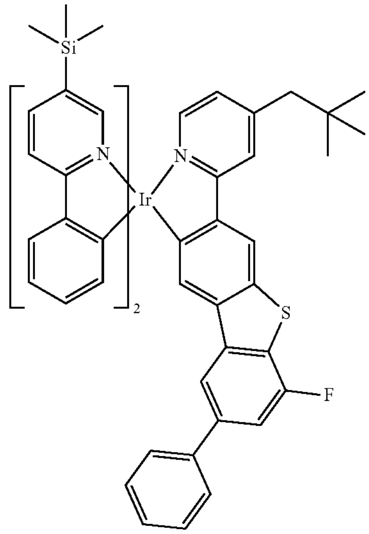

-continued
1307
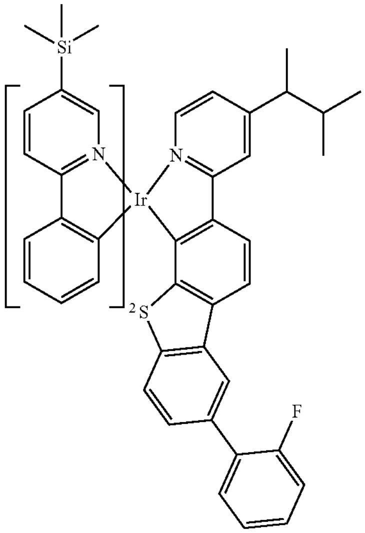
1308
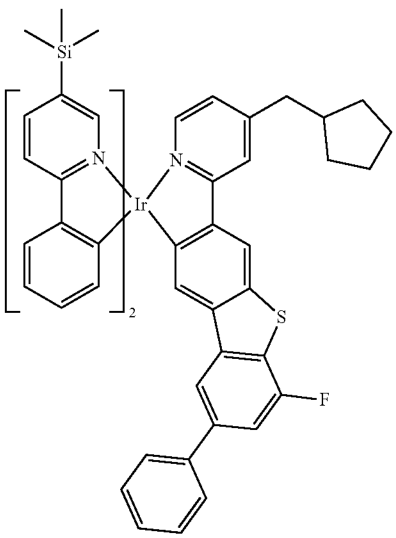
1309
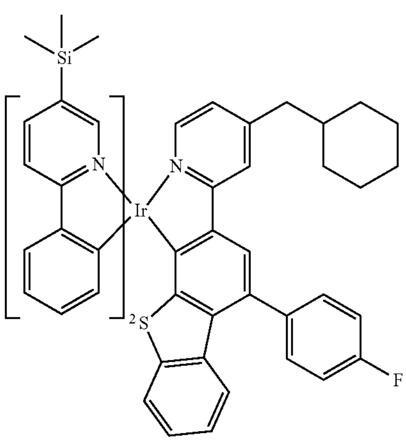
-continued
1310
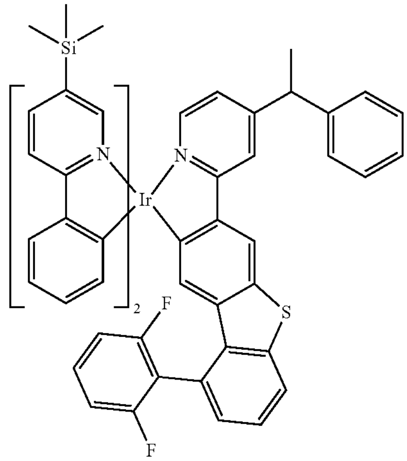
1311
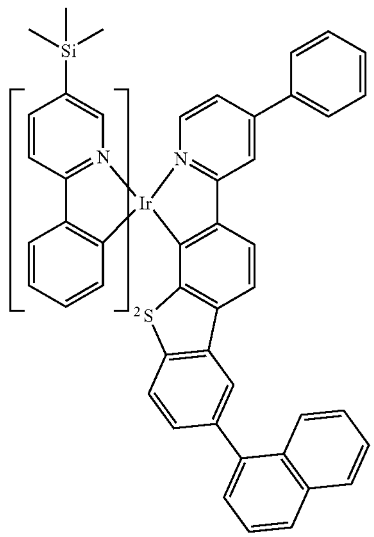
1312
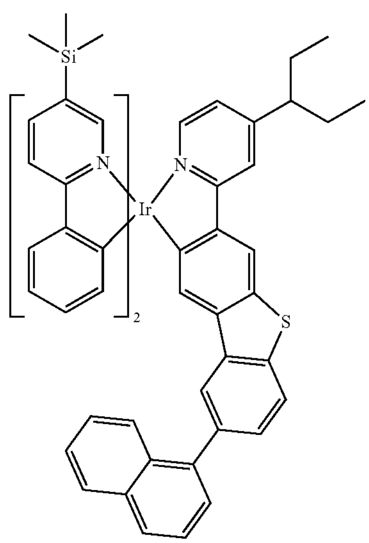

-continued
1313
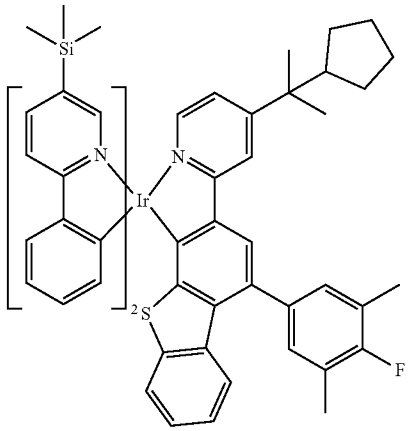
1314
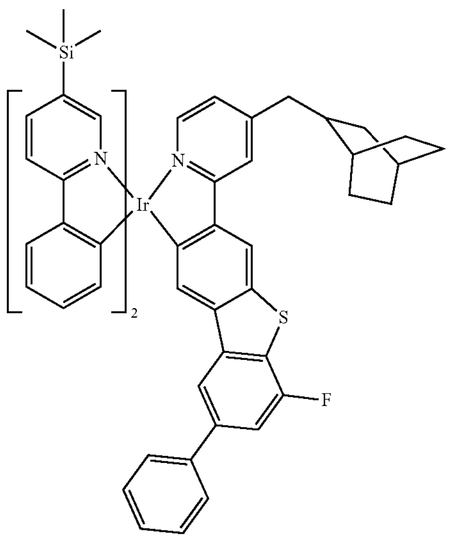
1315
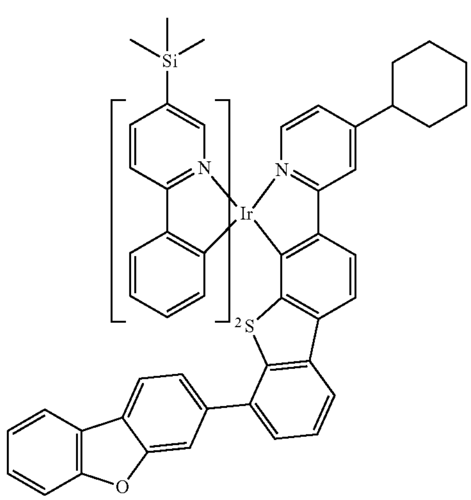
-continued
1316
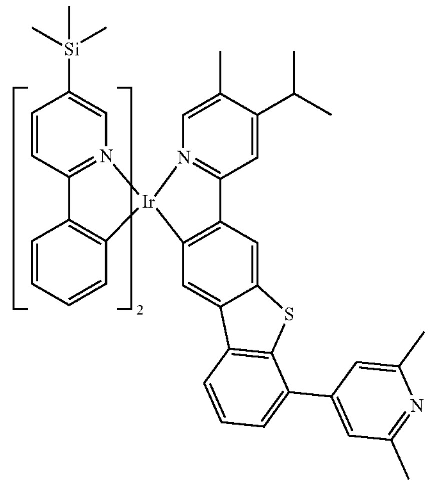
1317
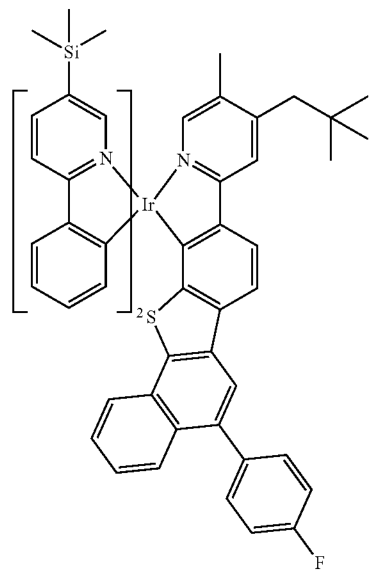
1318
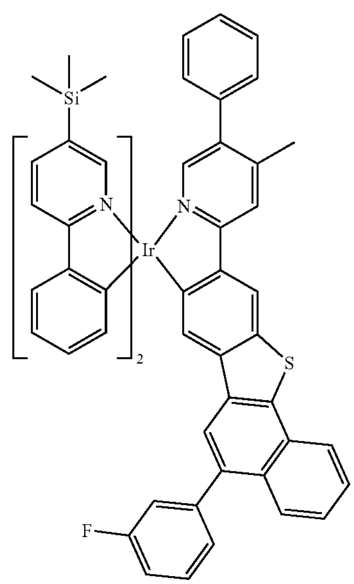

-continued
1319
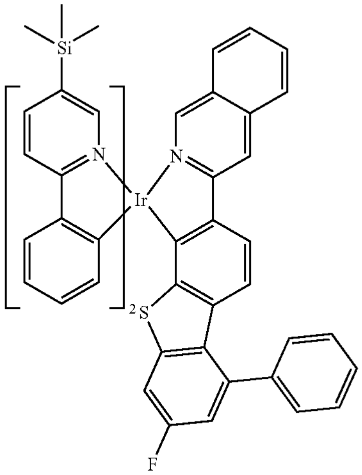
1320
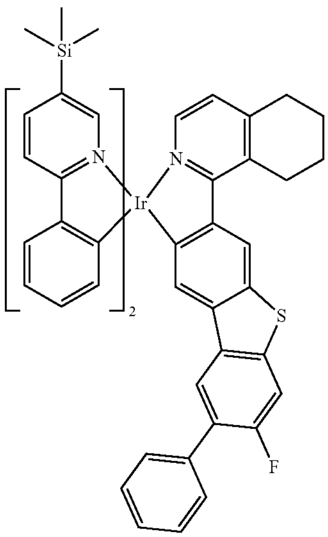
1321
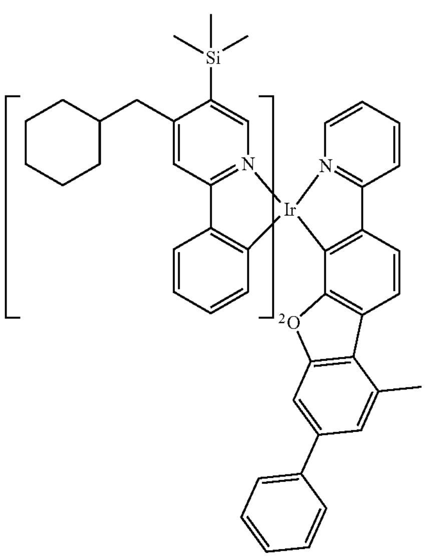
-continued
1322
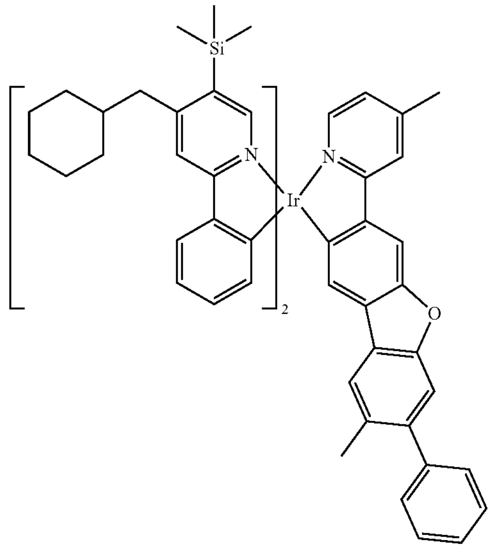
1323
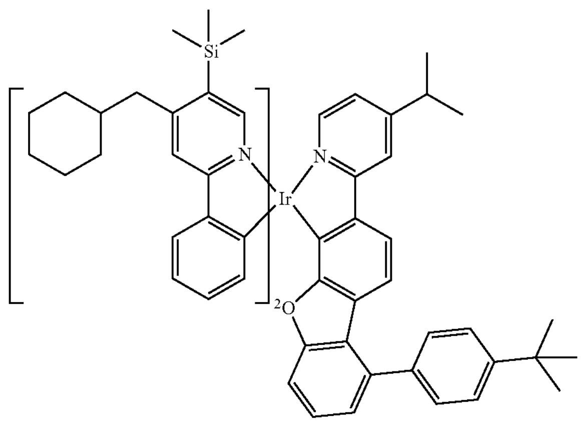
1324
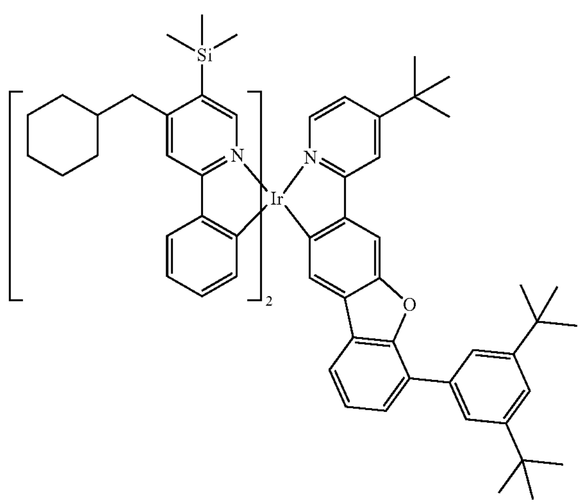

1325
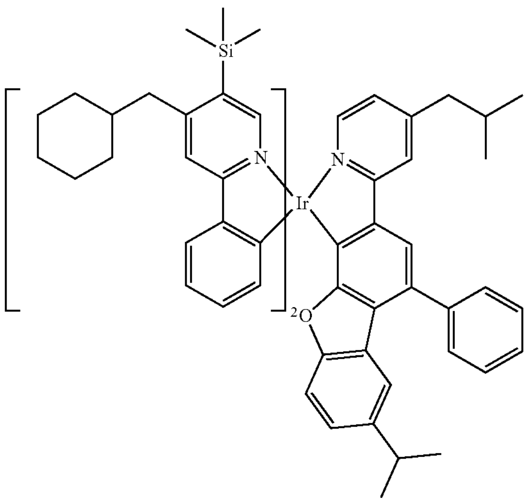
1326
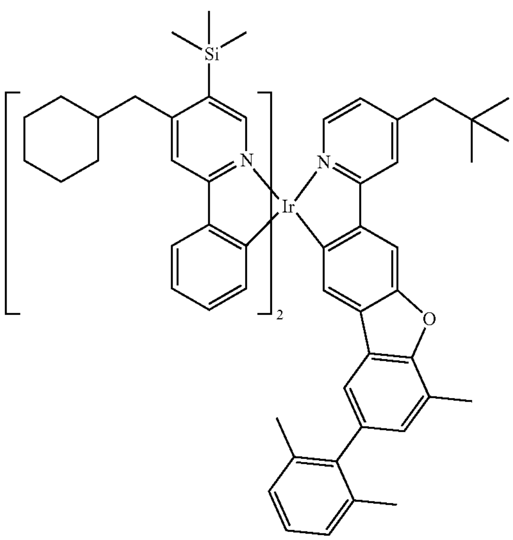
1327
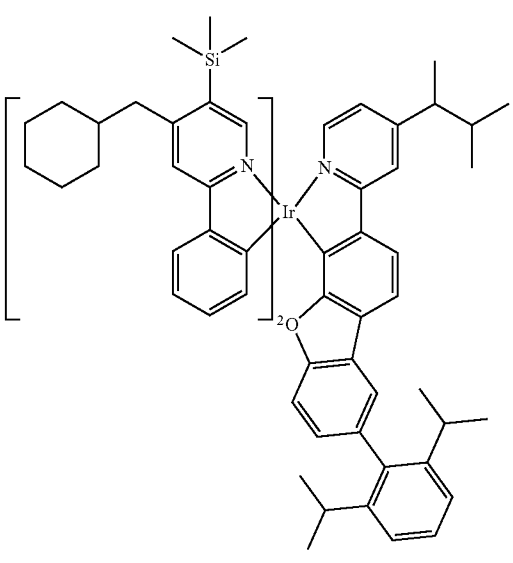
1328
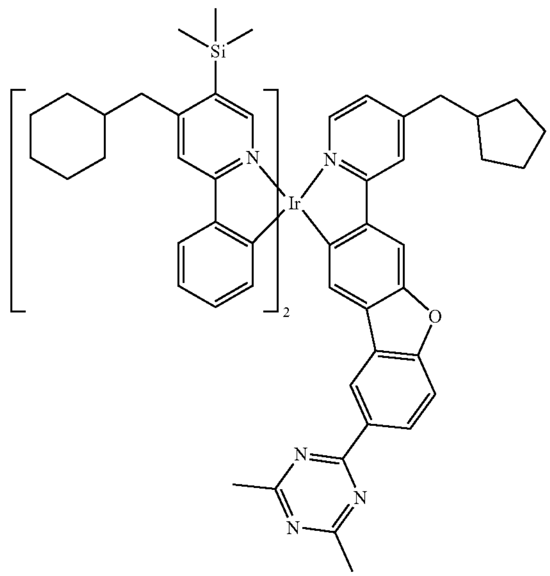
1329
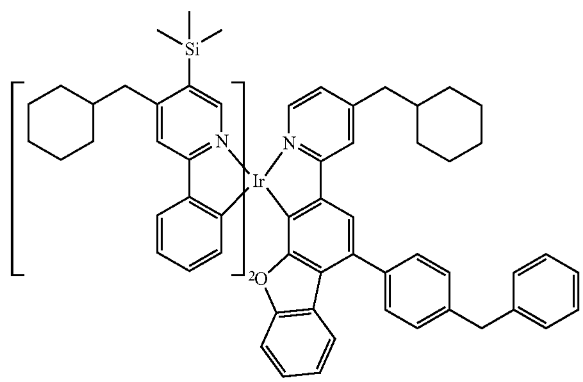
1330
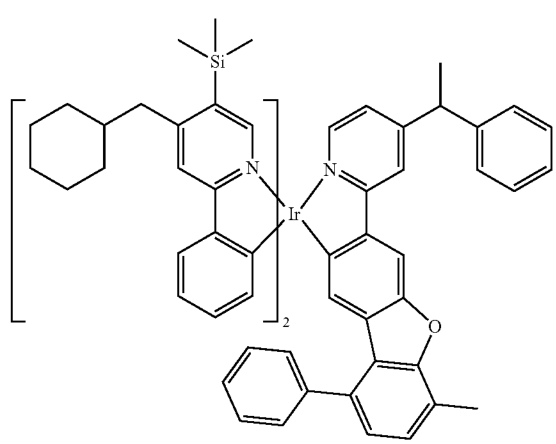

1331
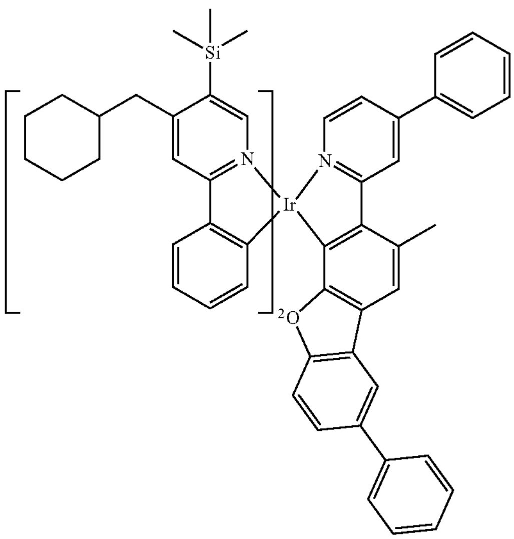
1332
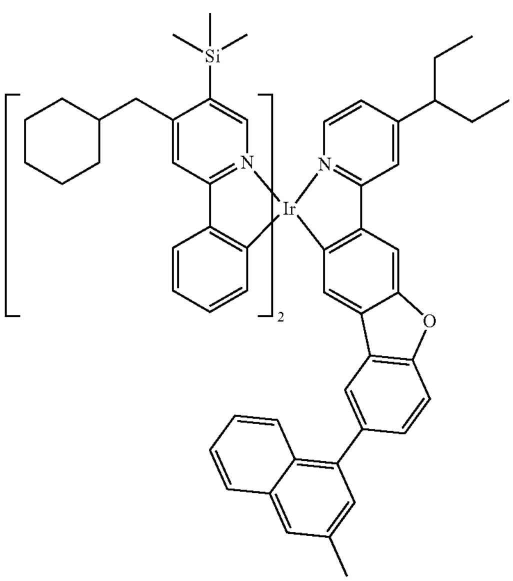
1333
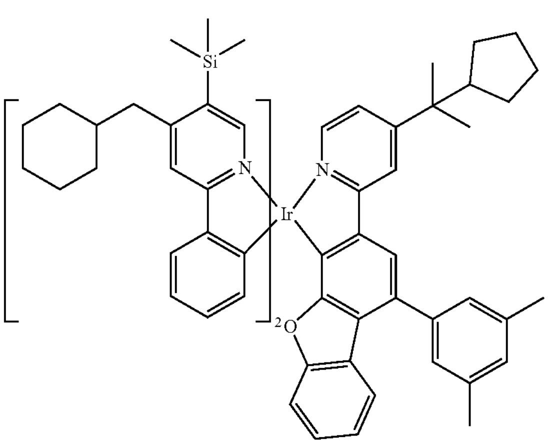
1334
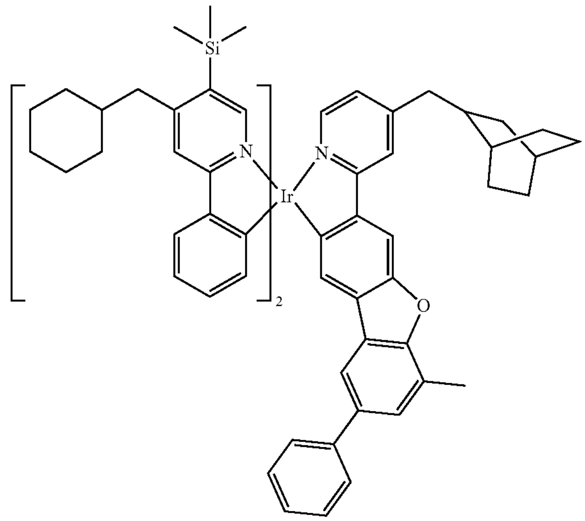
1335
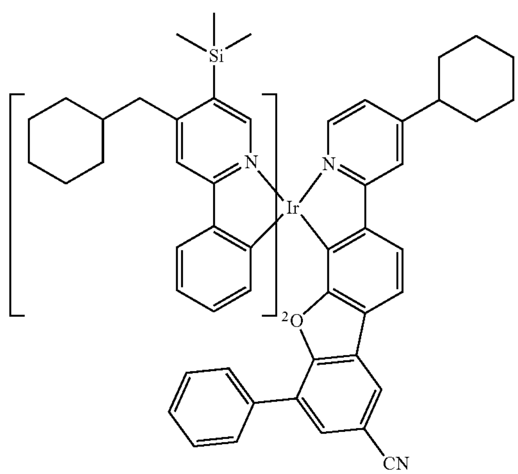
1336
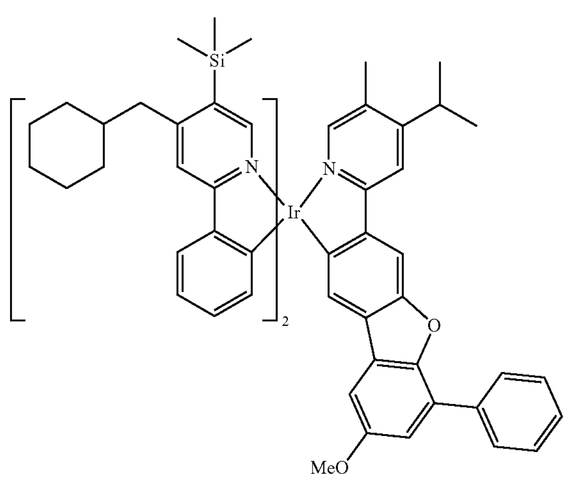

-continued
1337
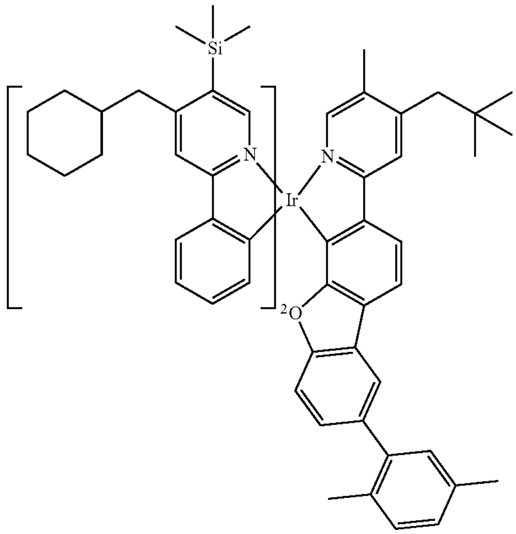
1338
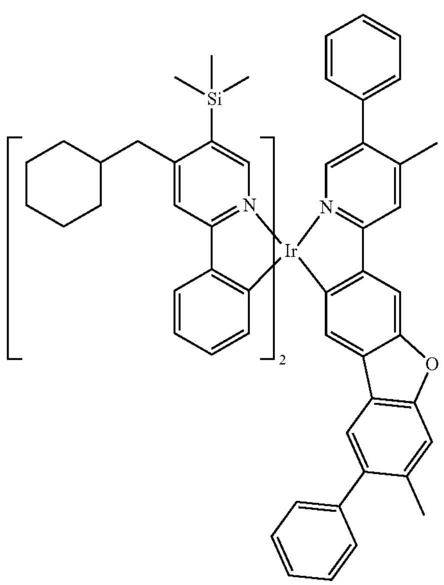
1339
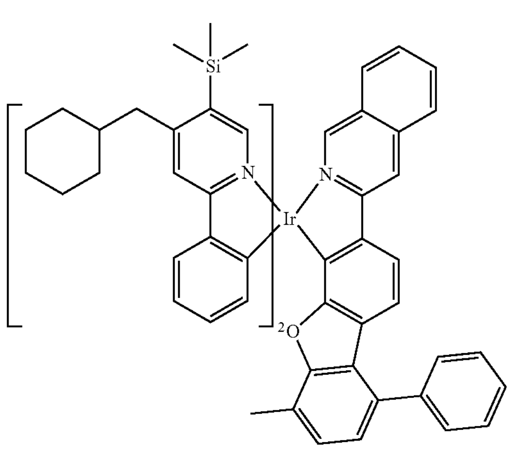
-continued
1340
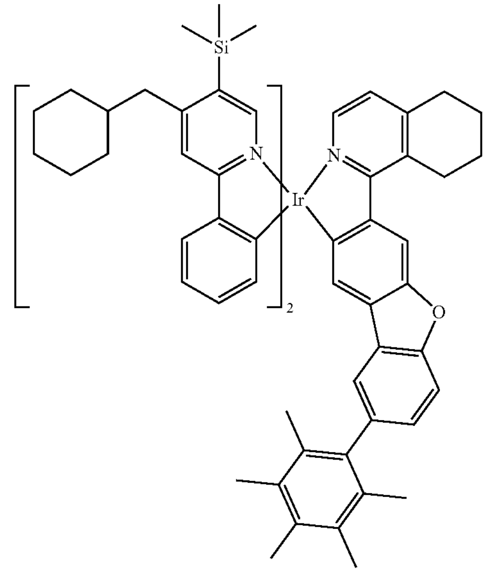
1341
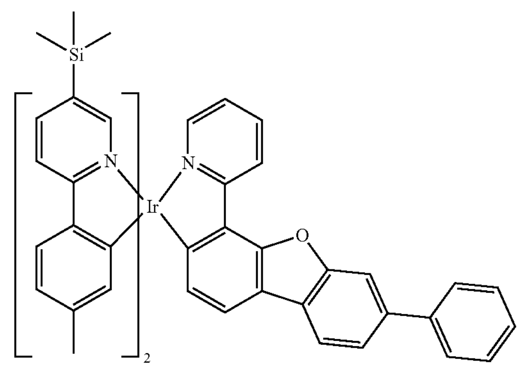
1342
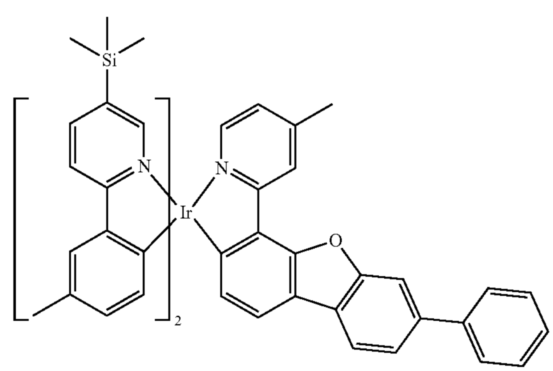

-continued
1343
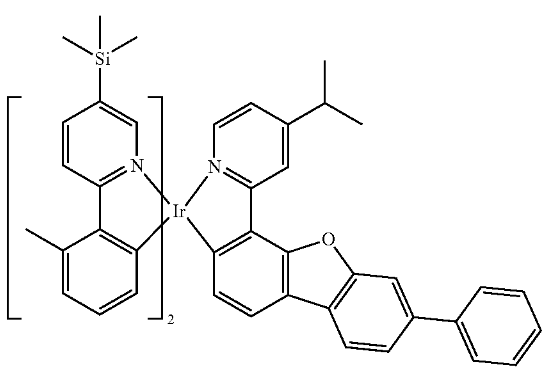
1344
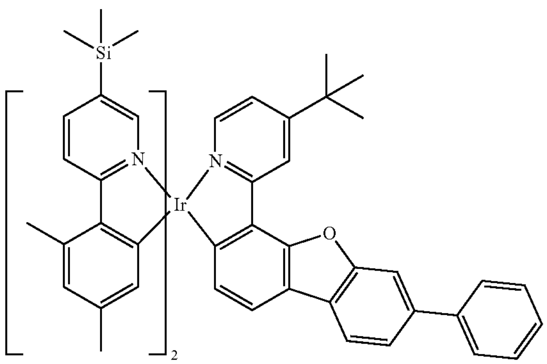
1345
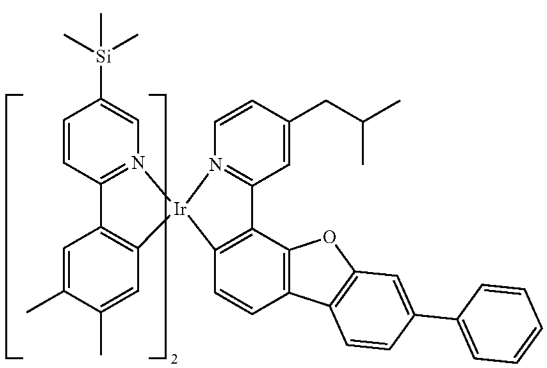
1346
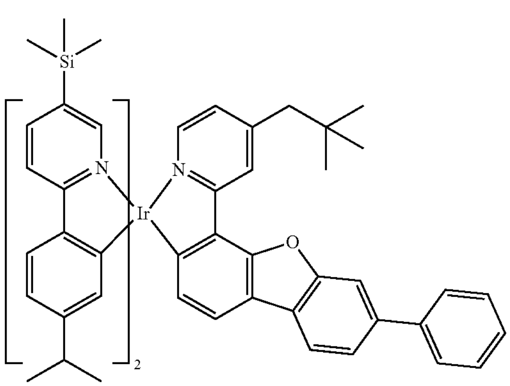
-continued
1347
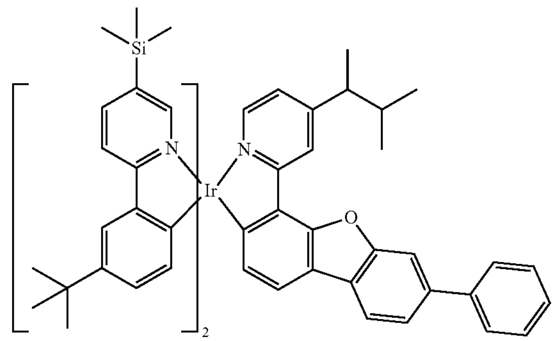
1348
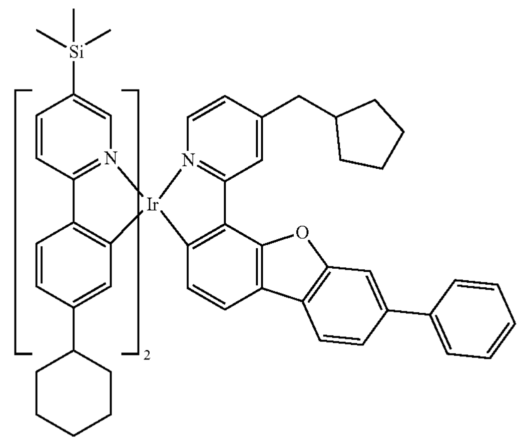
1349
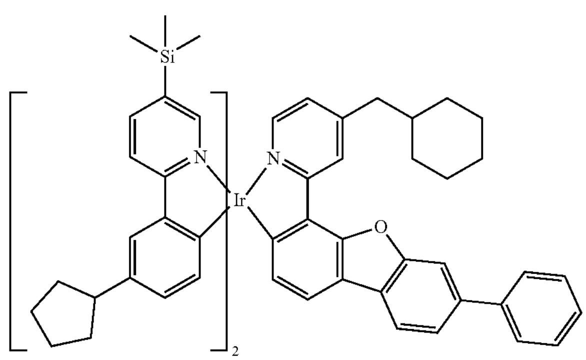
1350
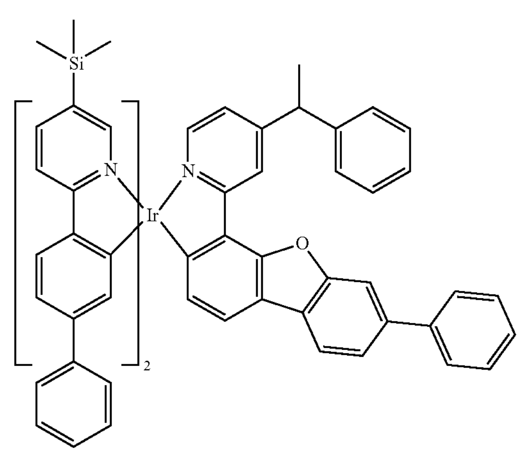

-continued
1351
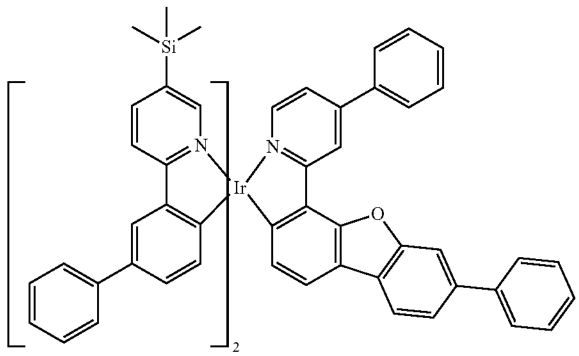
1352
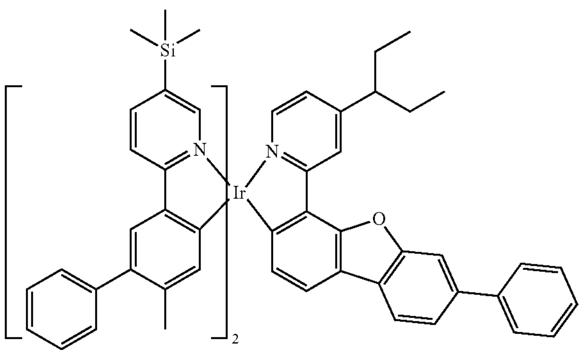
1353
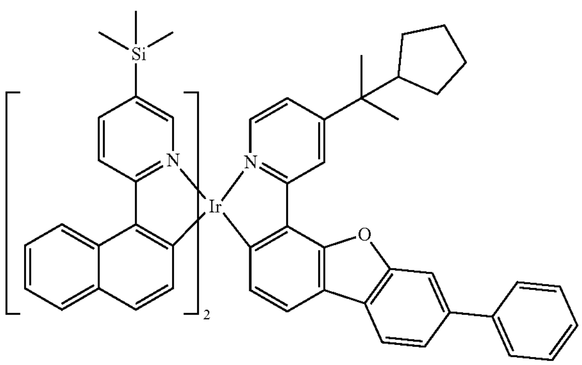
1354
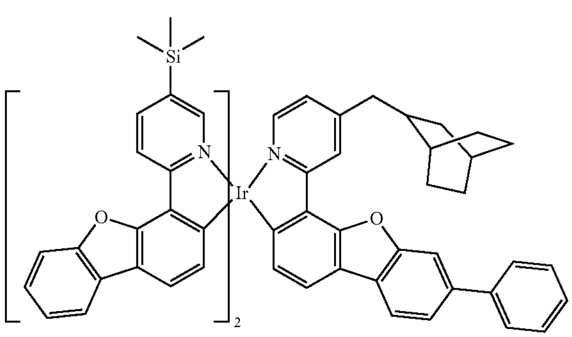
-continued
1355
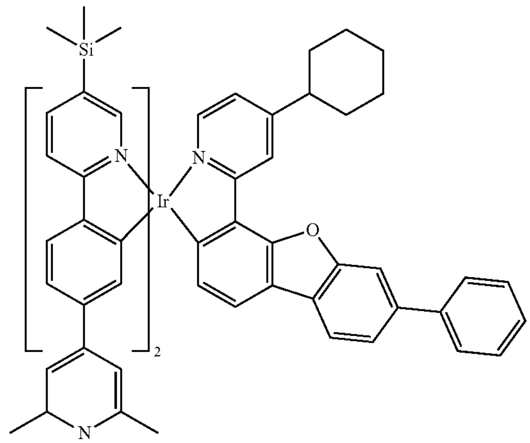
1356
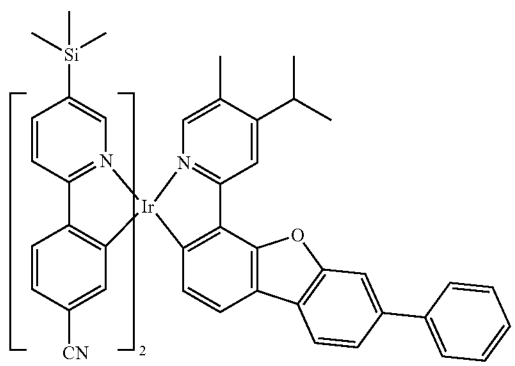
1357
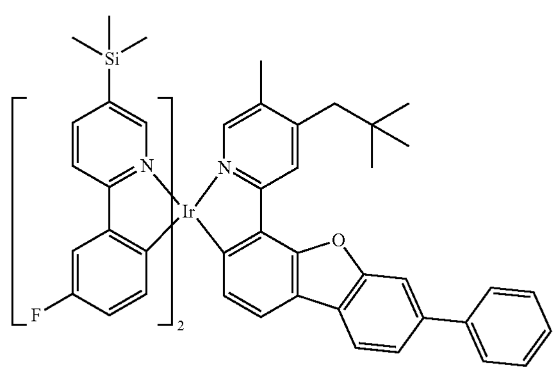

-continued
1358
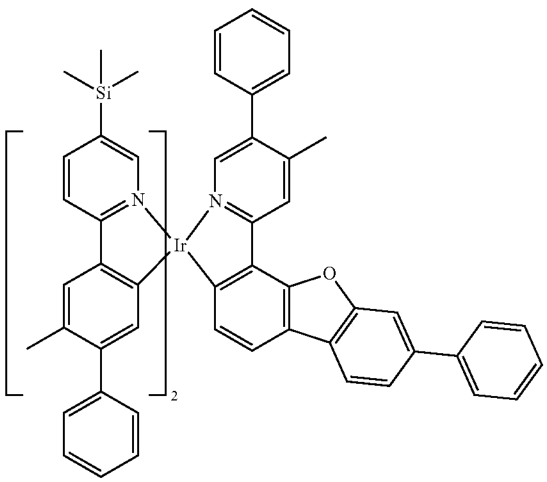
1359
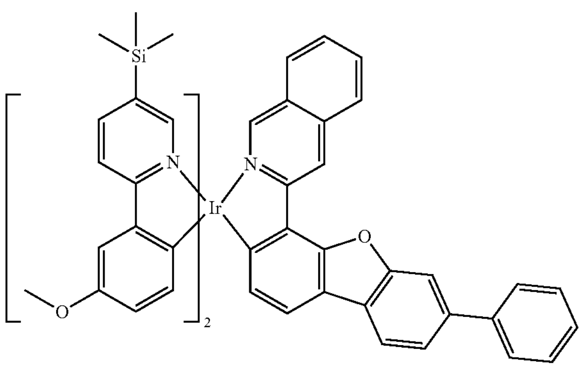
1360
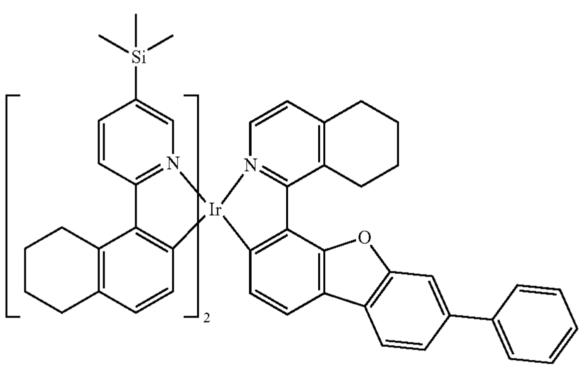
1361
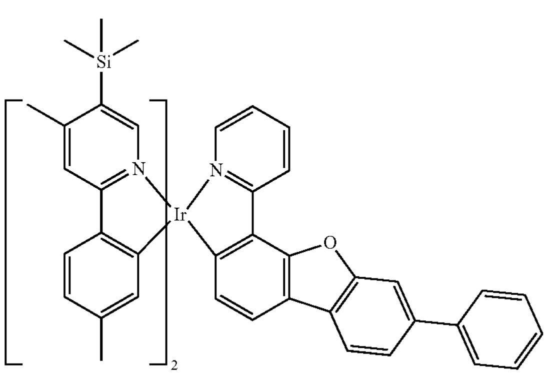
-continued
1362
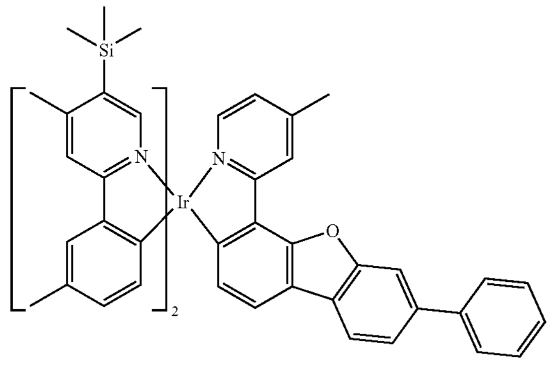
1363
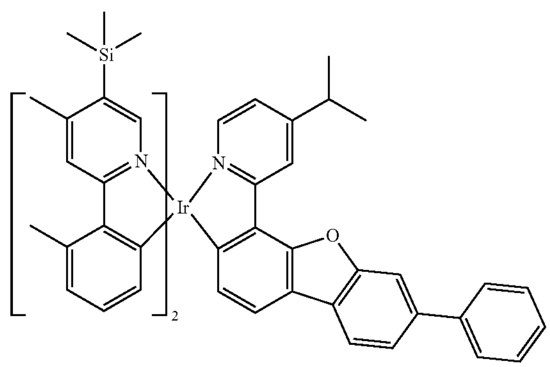
1364
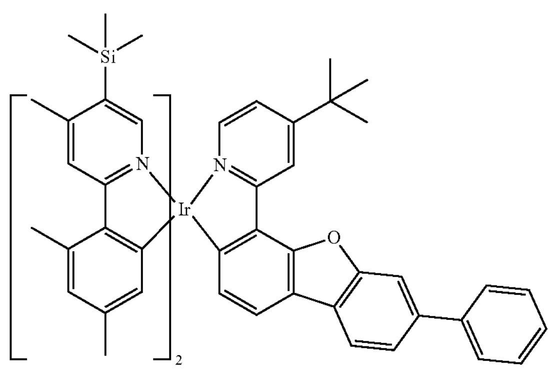
1365
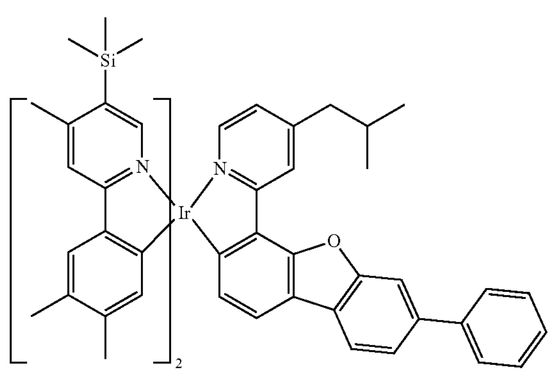

1366
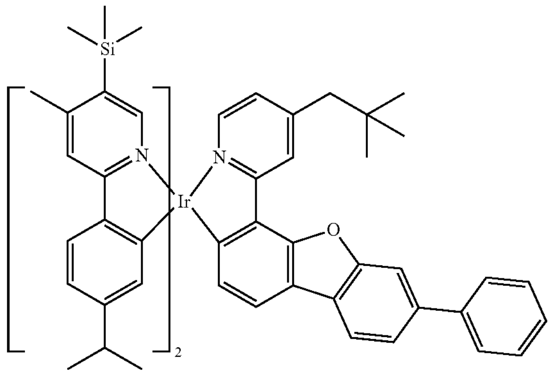
1367
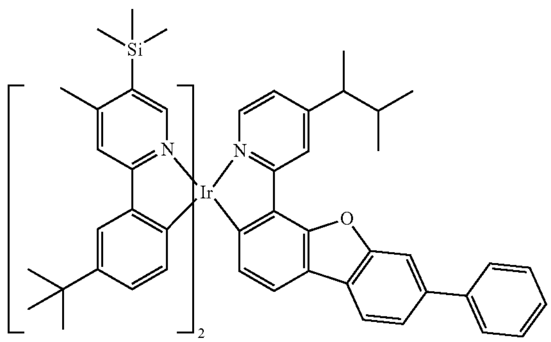
1368
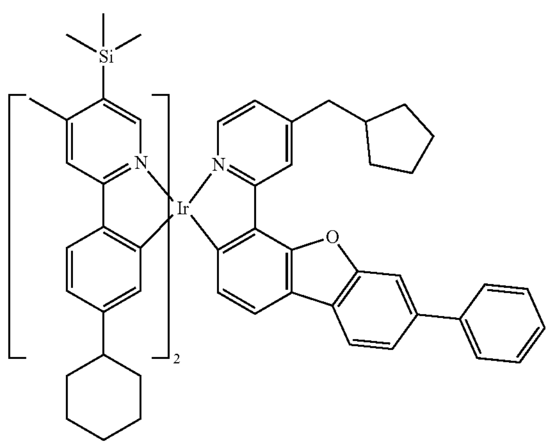
1369
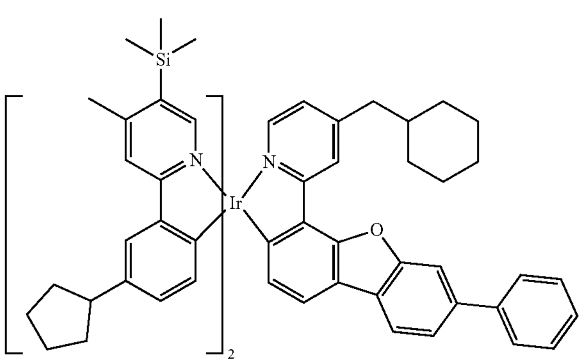
1370
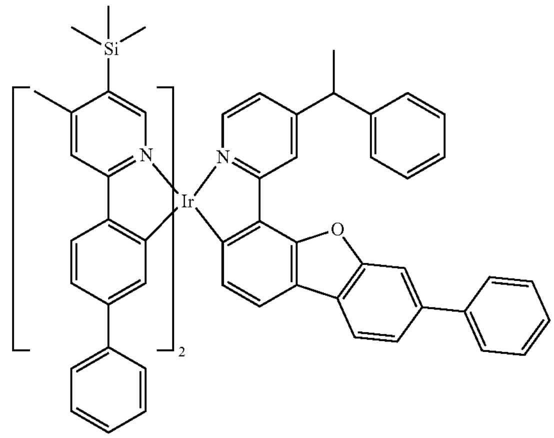
1371
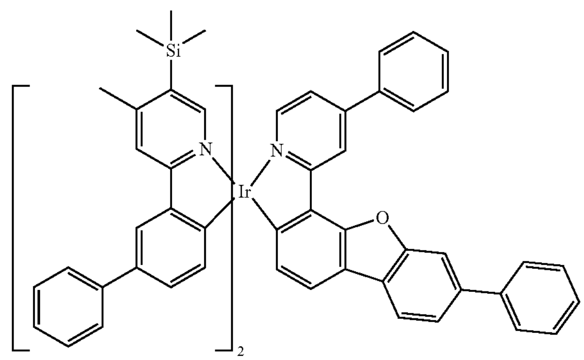
1372
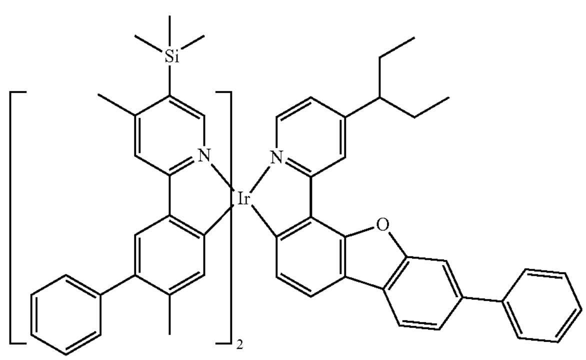
1373
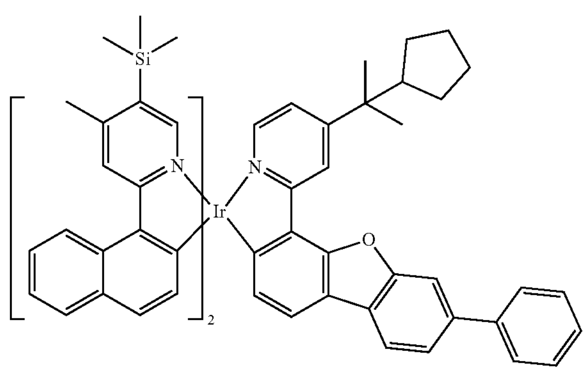

-continued
1374
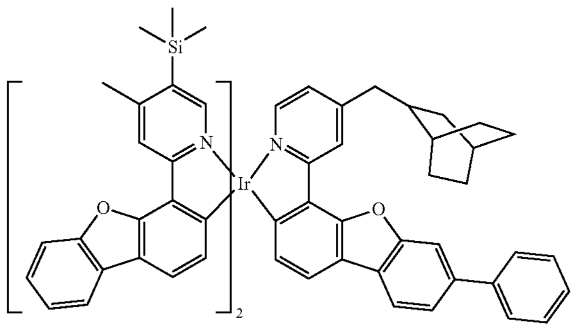
1375
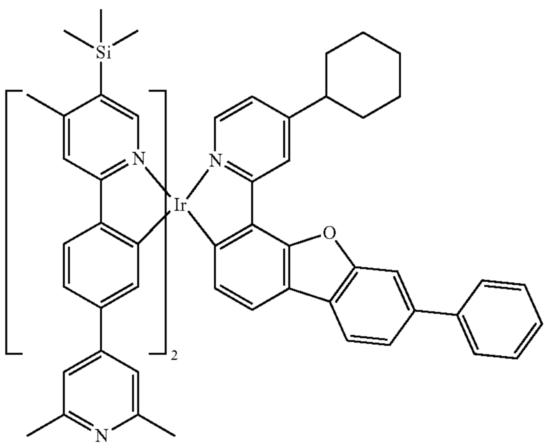
1376
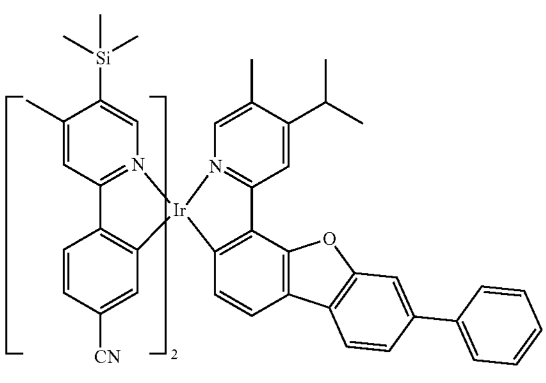
1377
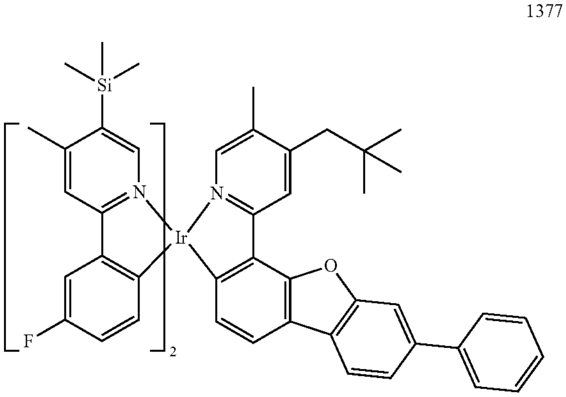
-continued
1378
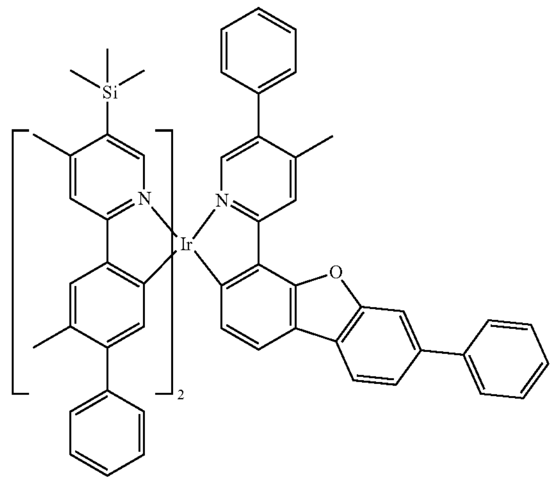
1379
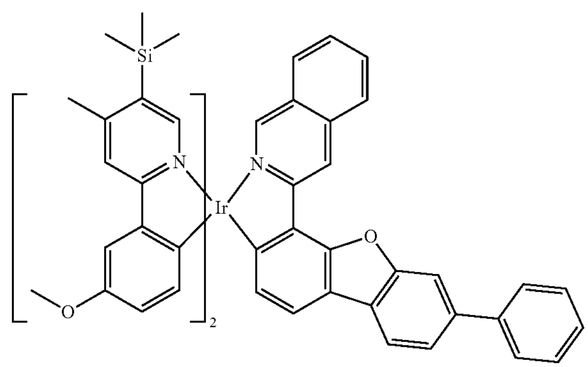
1380
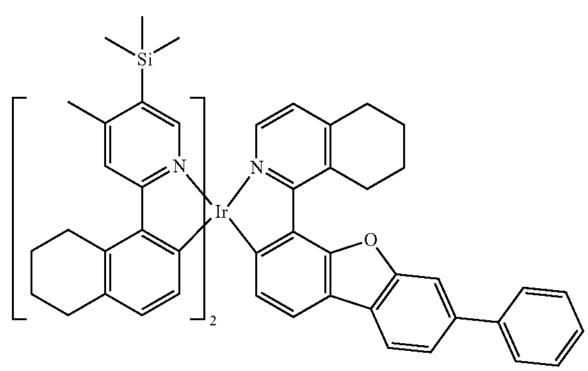
1381
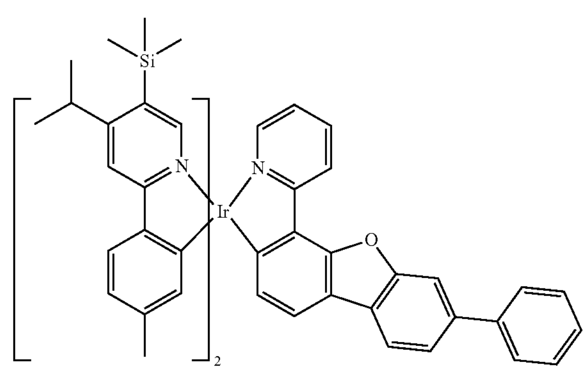

-continued
1382
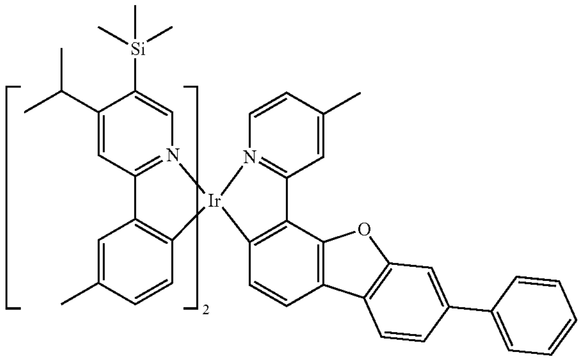
1383
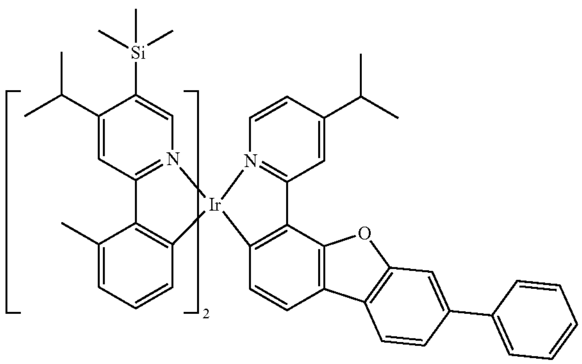
1384
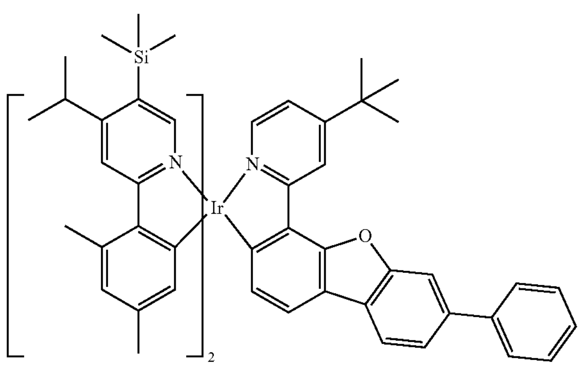
1385
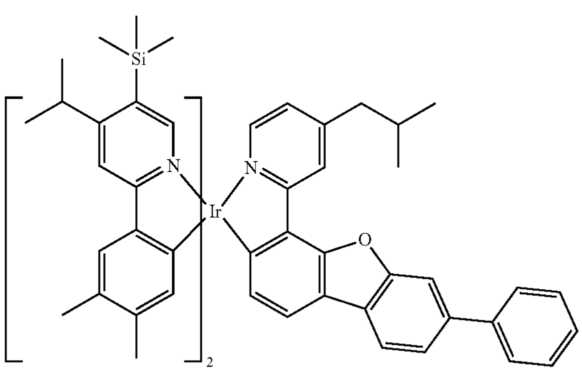
-continued
1386
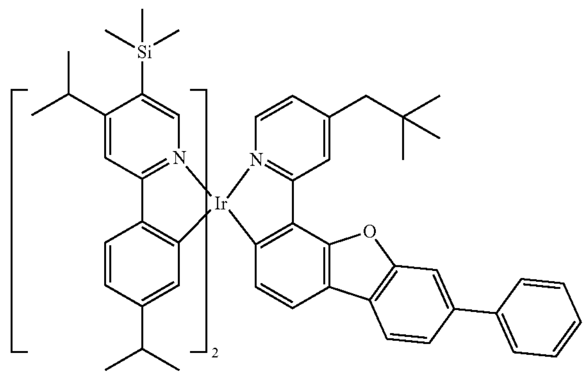
1387
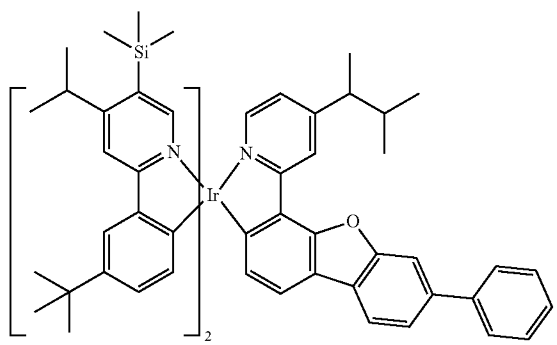
1388
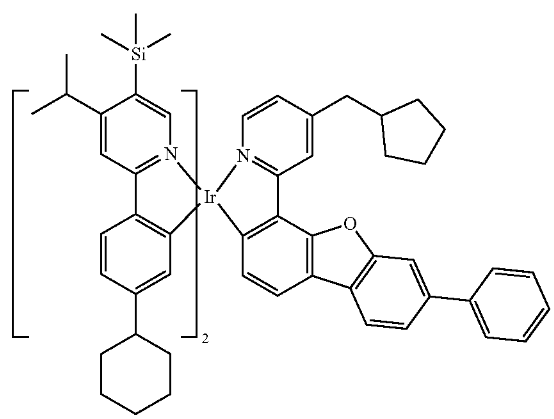
1389
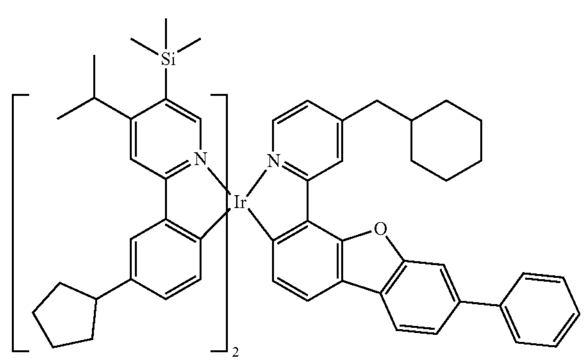

-continued
1390
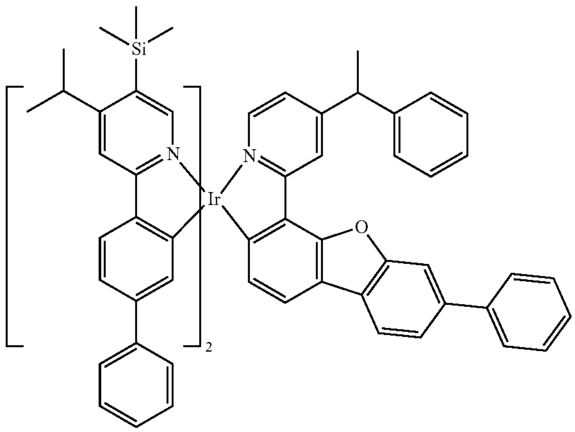
1391
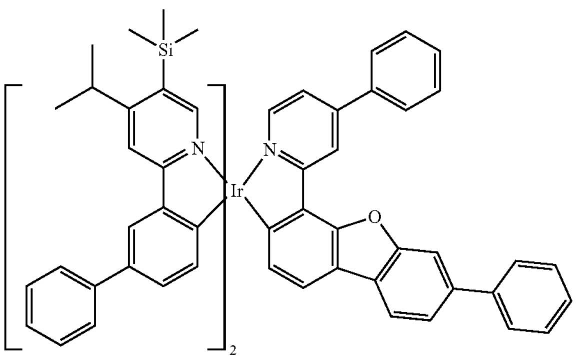
1392
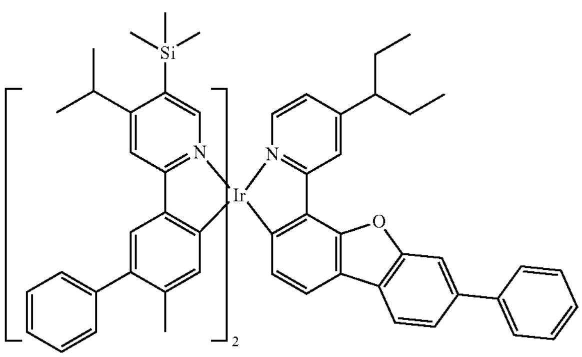
1393
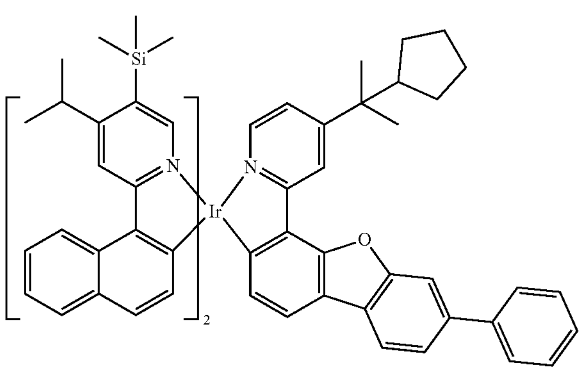
-continued
1394
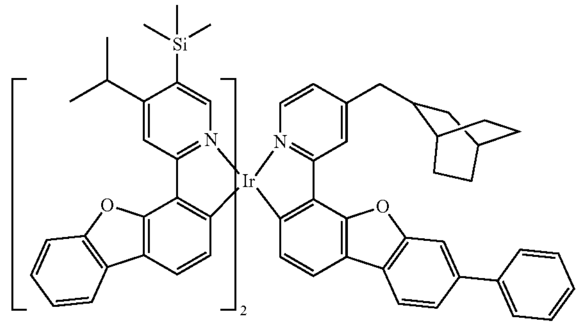
1395
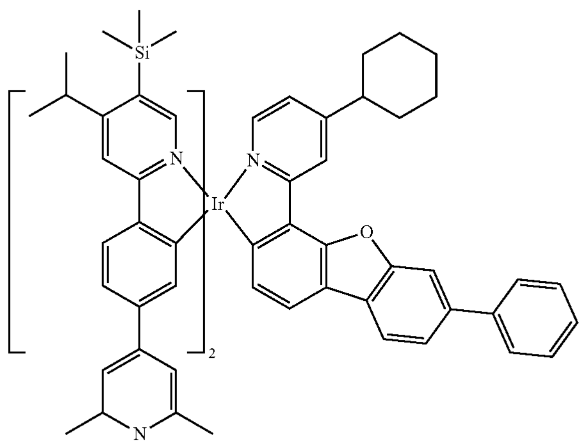
1396
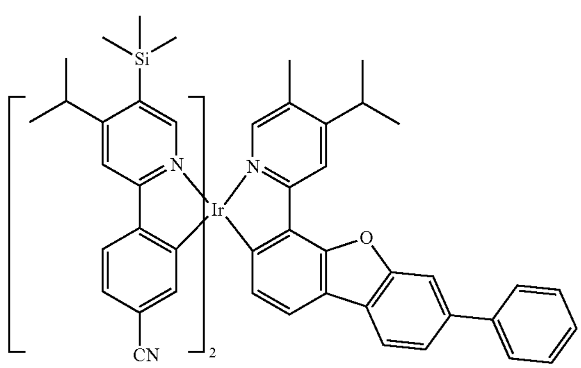

-continued
1397
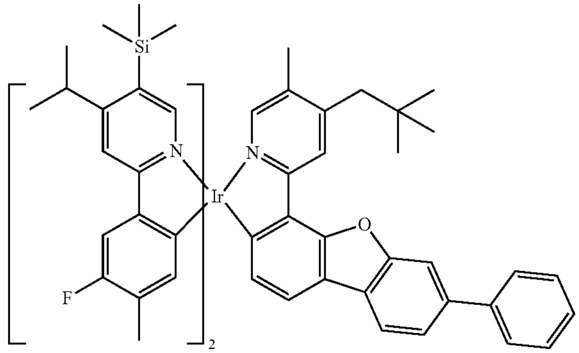
1398
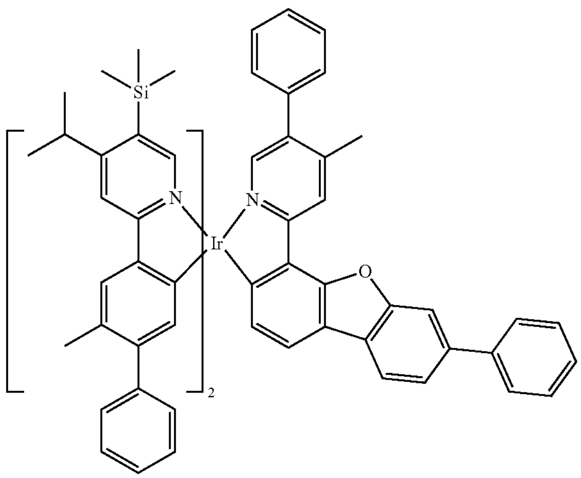
1399
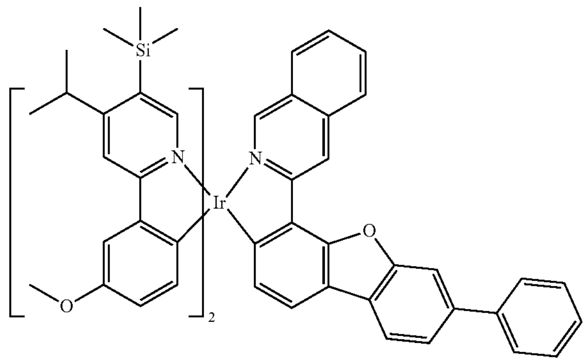
1400
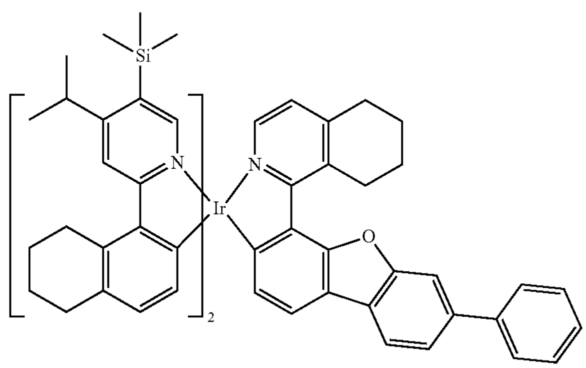
1401
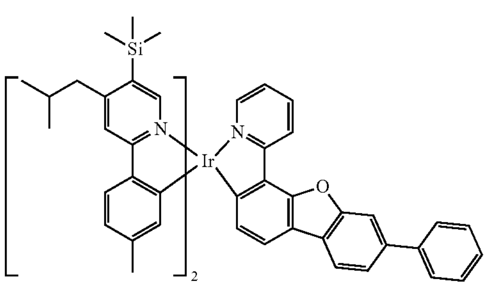
1402
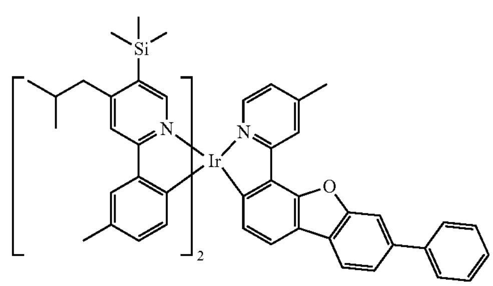
1403
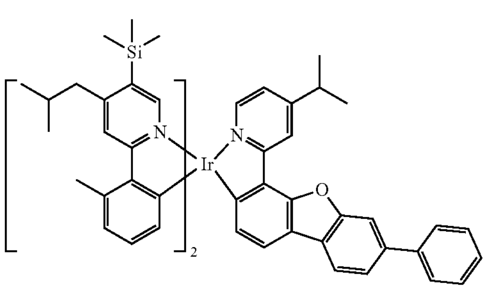
1404
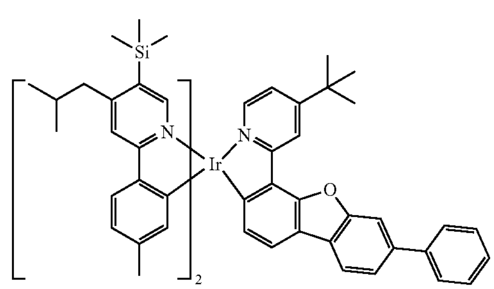

-continued
1405
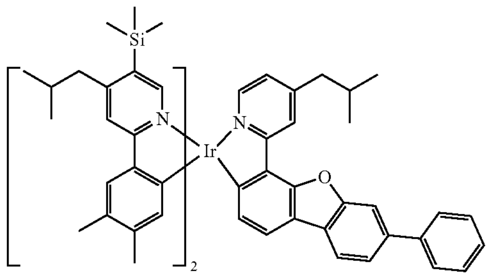
1406
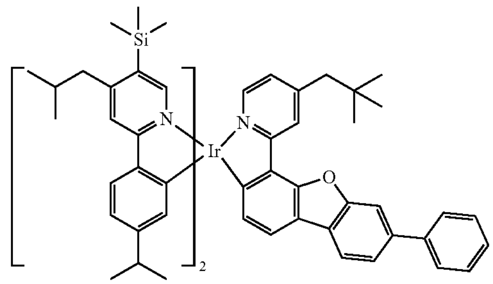
1407
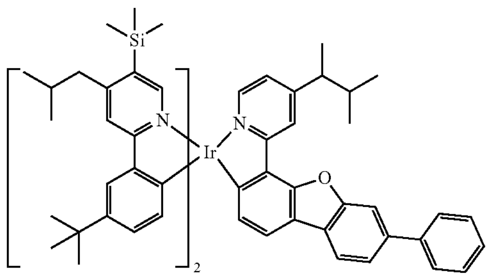
1408
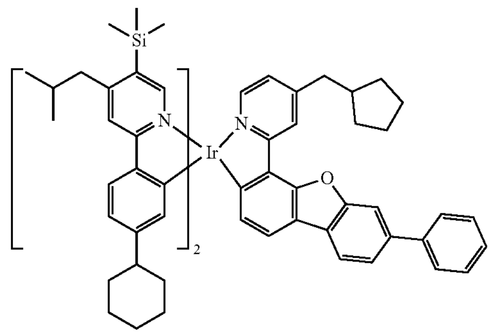
1409
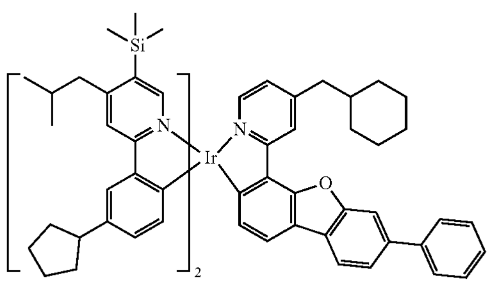
1410
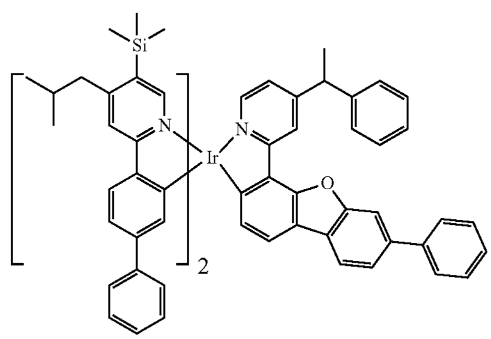
1411
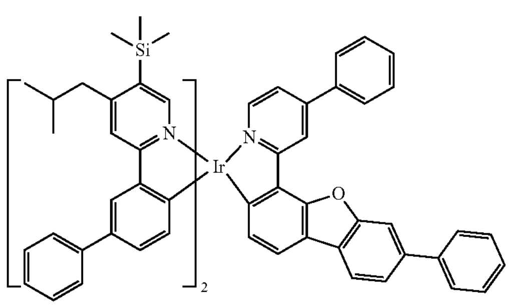
1412
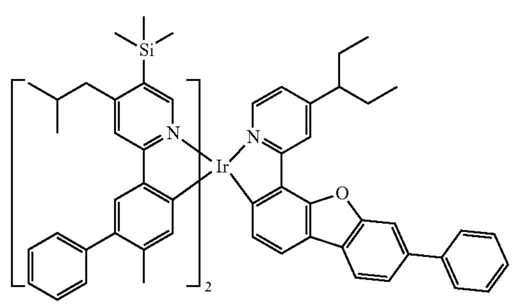
1413
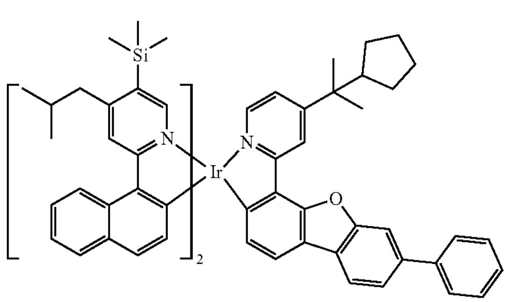
1414
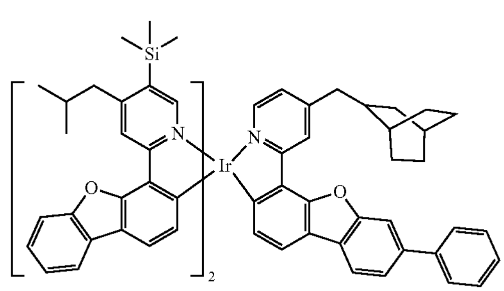

-continued
1415
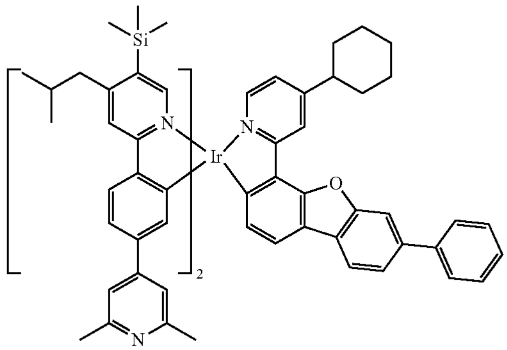
1416
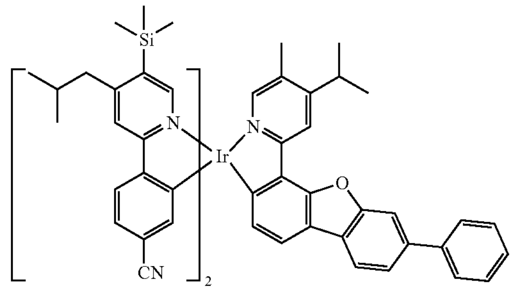
1417
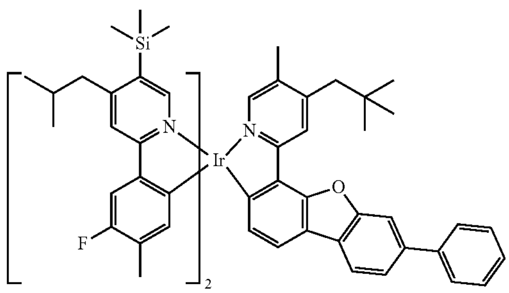
1418
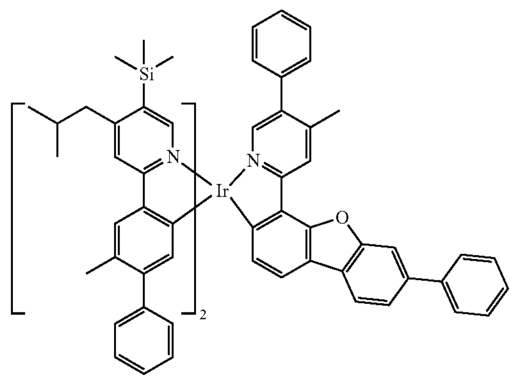
1419
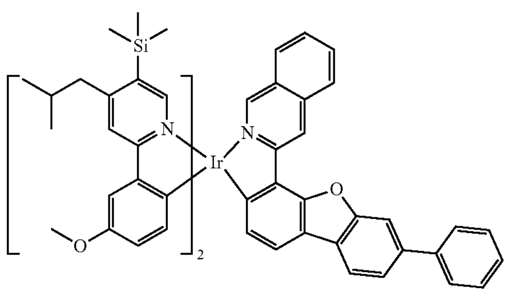
1420
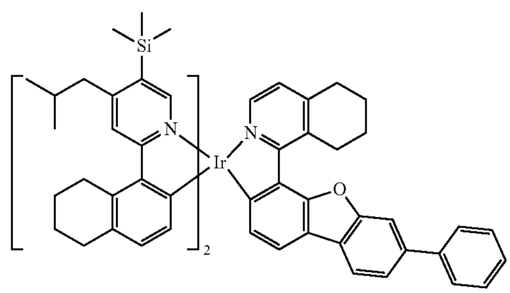
1421
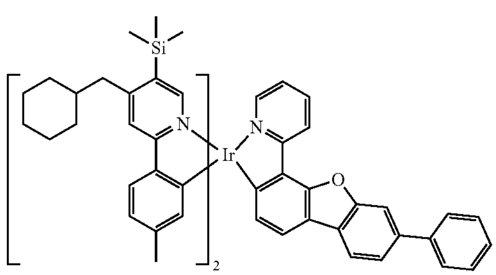
1422
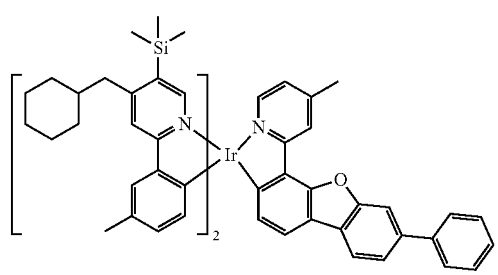
1423
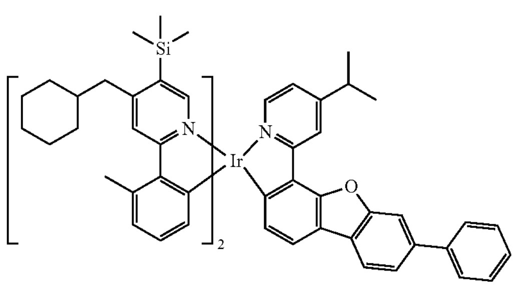
1424
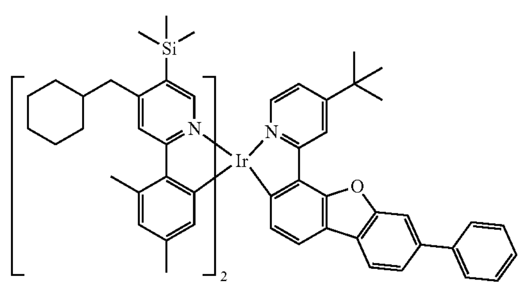

-continued
1425
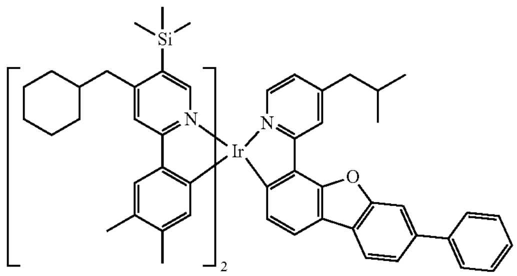
1426
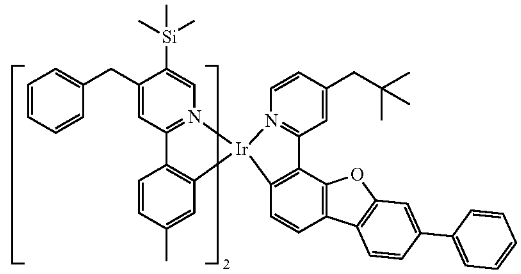
1427
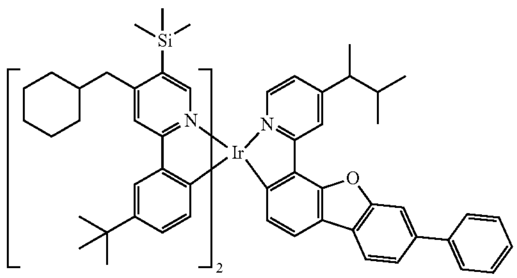
1428
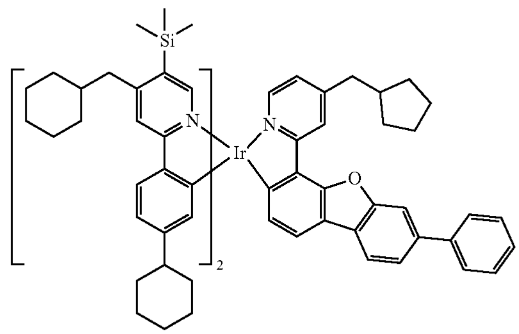
1429
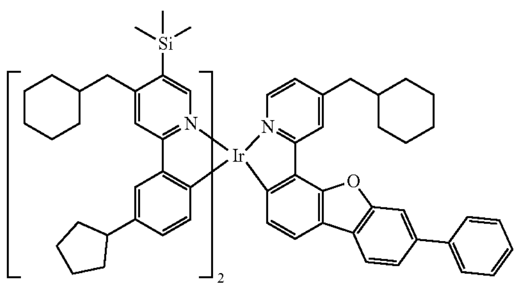
1430
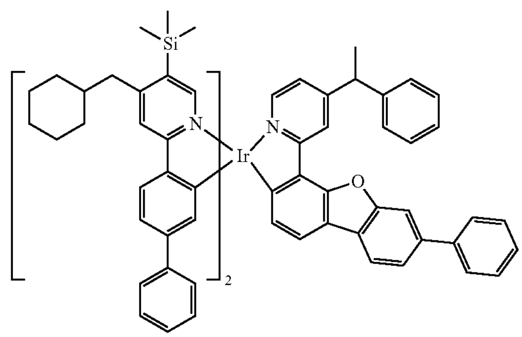
1431
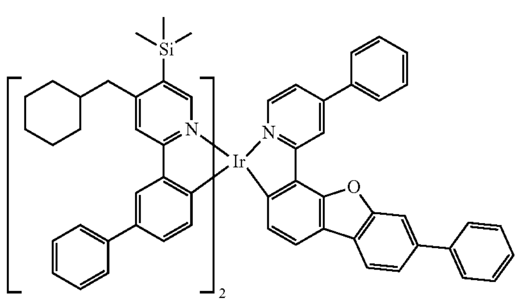
1432
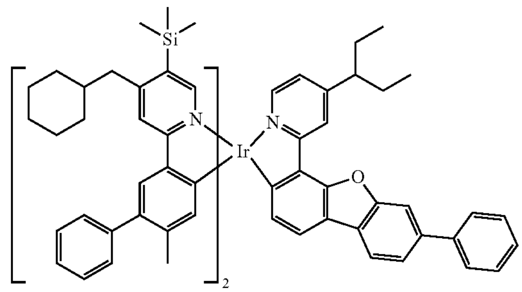
1433
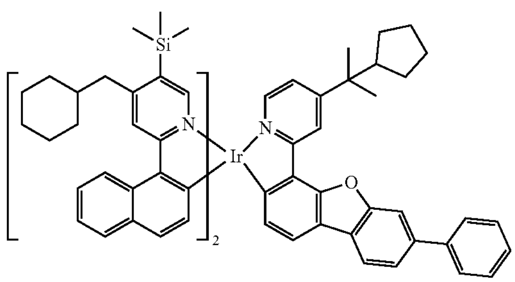
1434
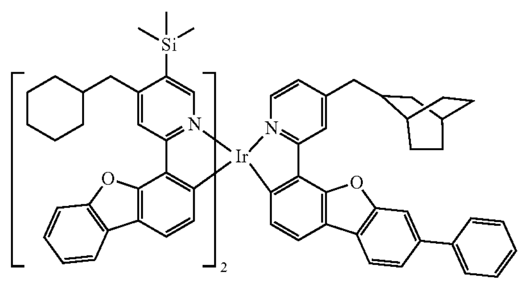

-continued
1435
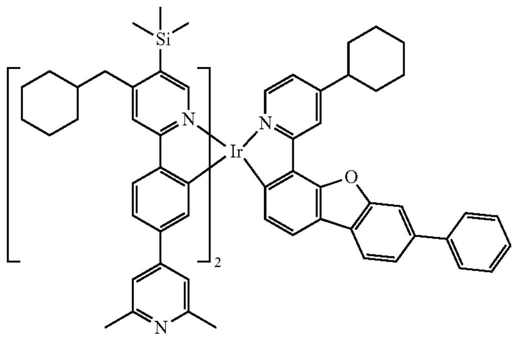
1436
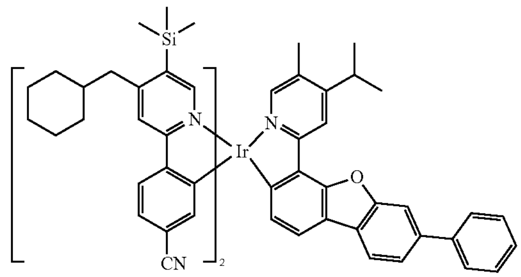
1437
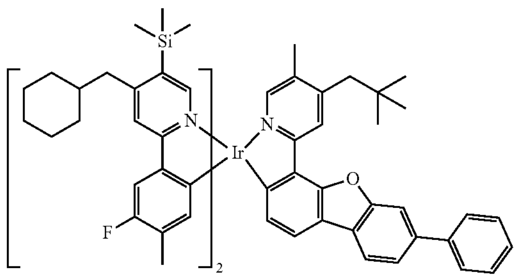
1438
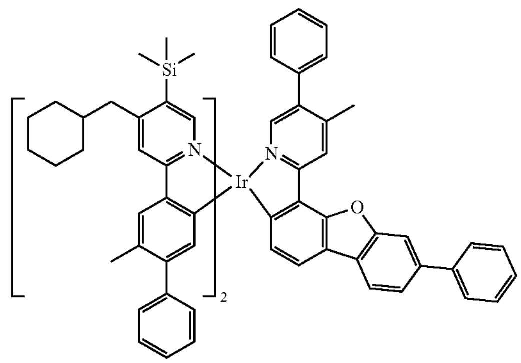
1439
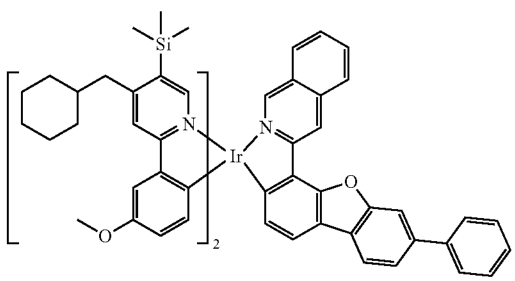
1440
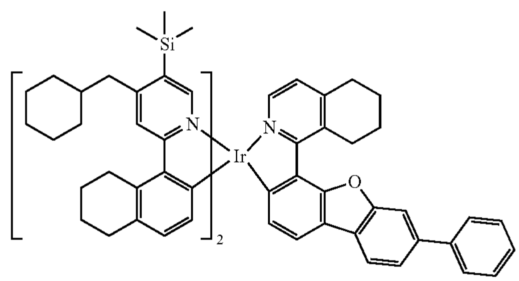
1441
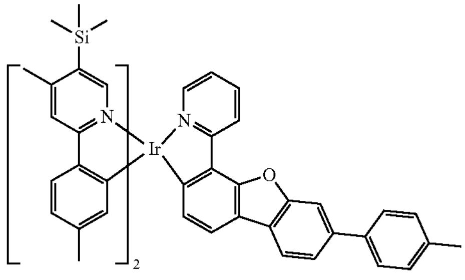
1442
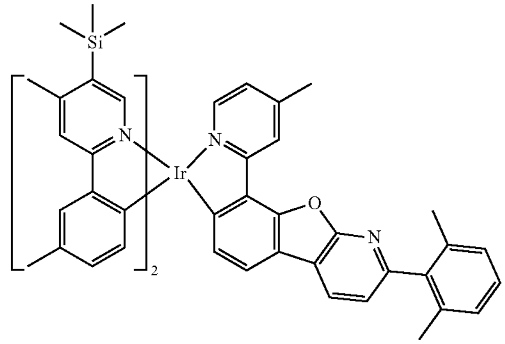

-continued
1443
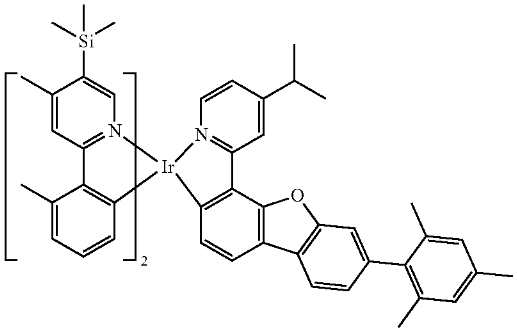
1444
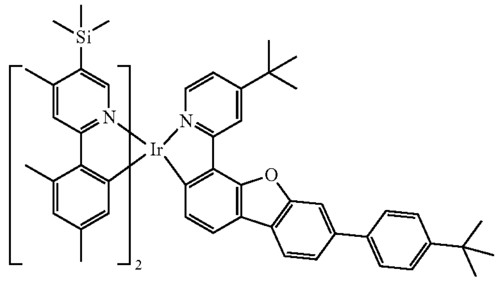
1445
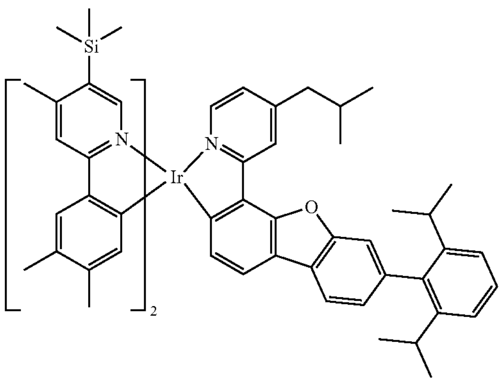
1446
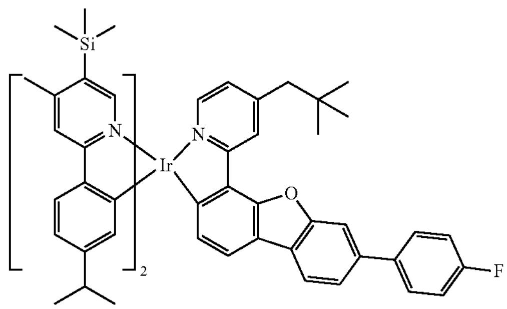
1447
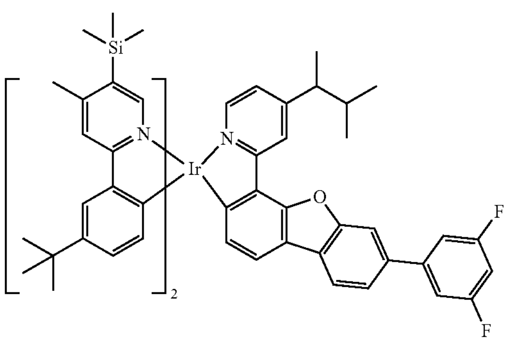
1448
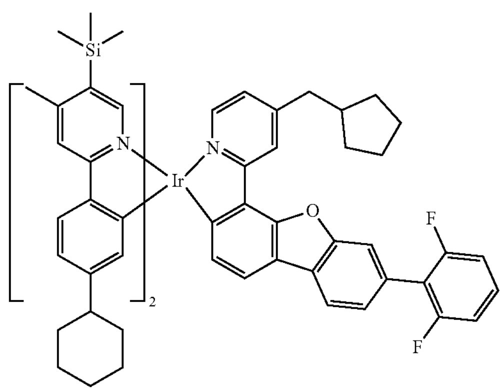
1449
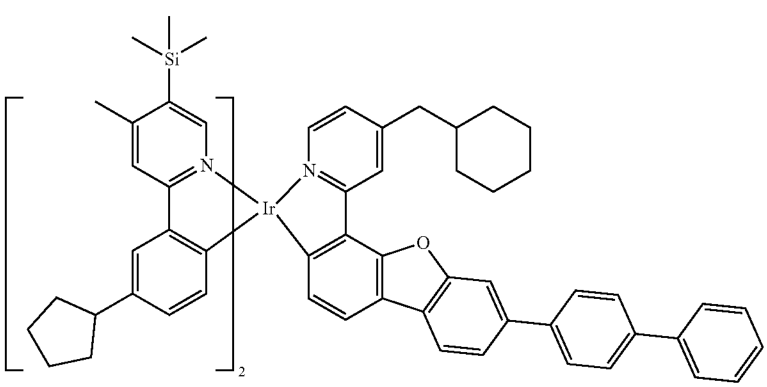

-continued
1450
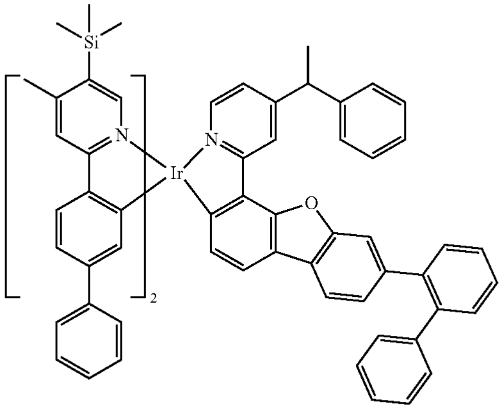
1451
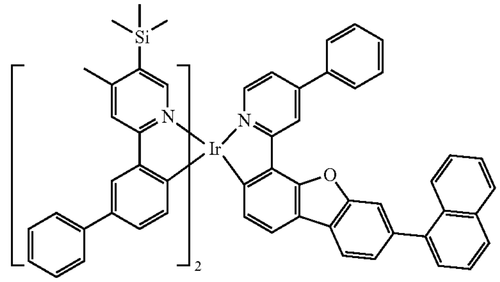
1452
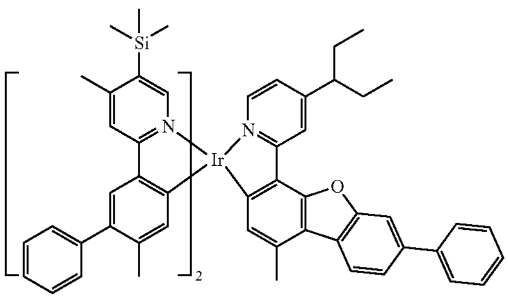
1453
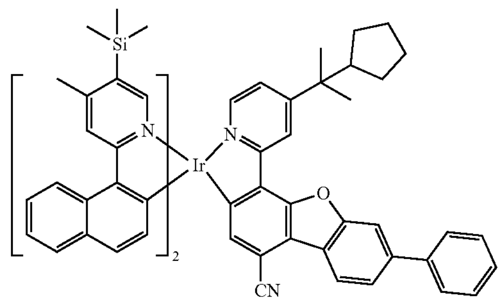
1454
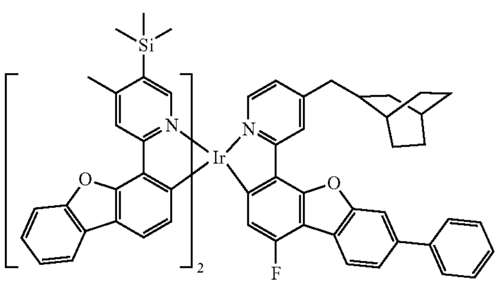
1455
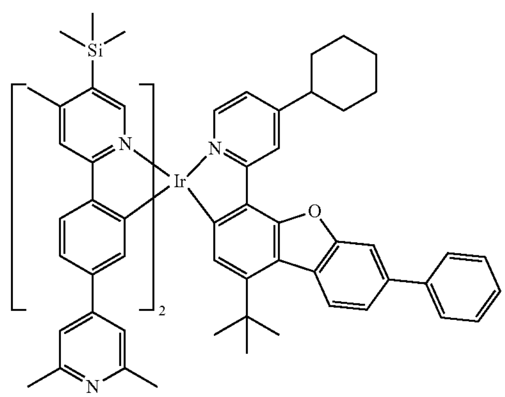
1456
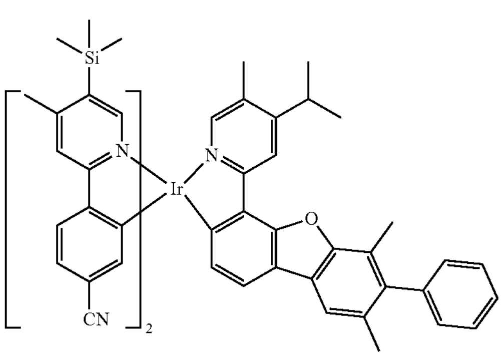
1457
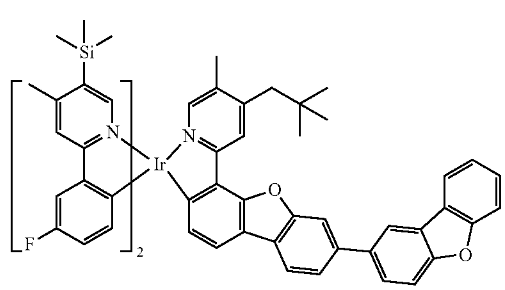

-continued
1458
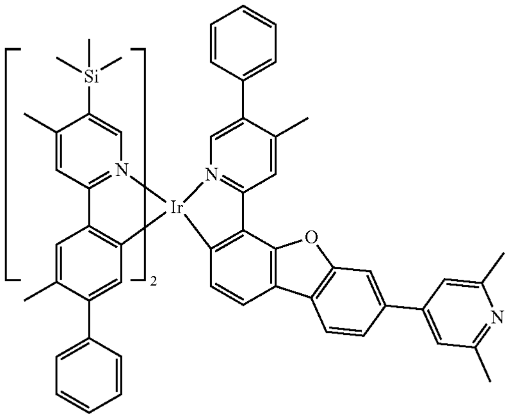
1459
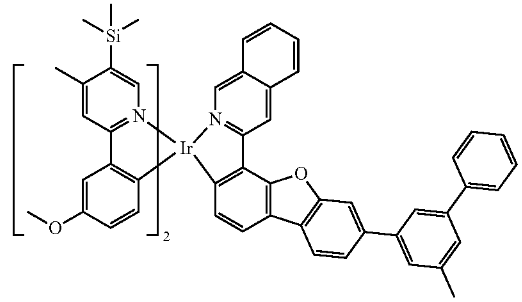
1460
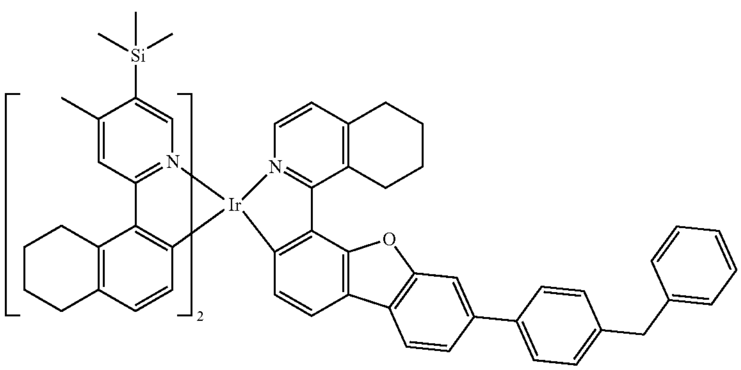
1461
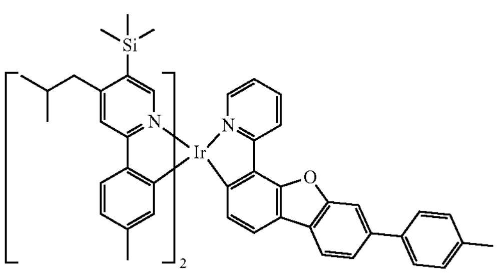
1462
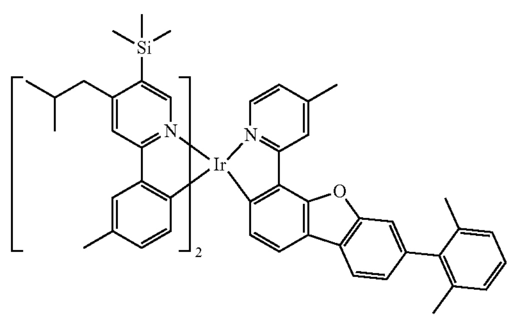
1463
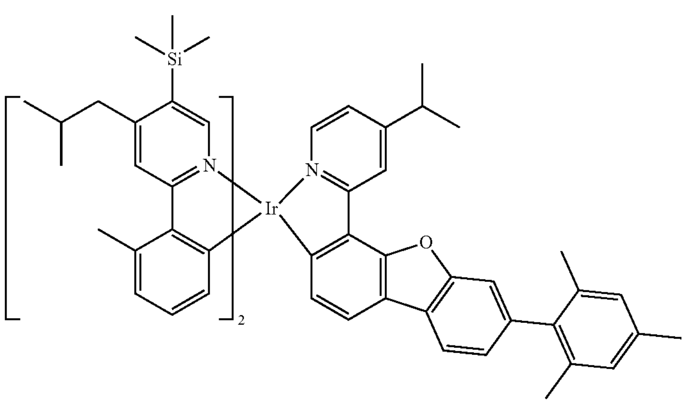

-continued
1464
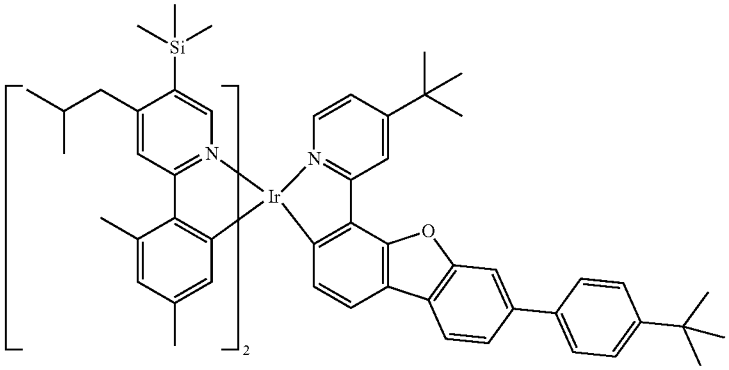
1465
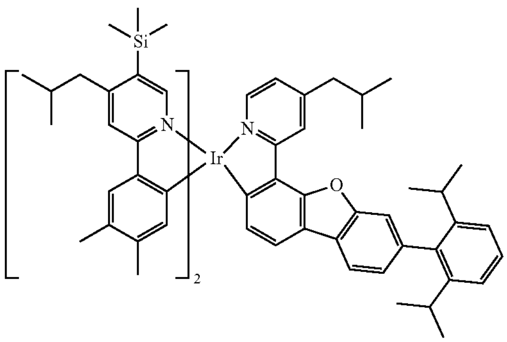
1466
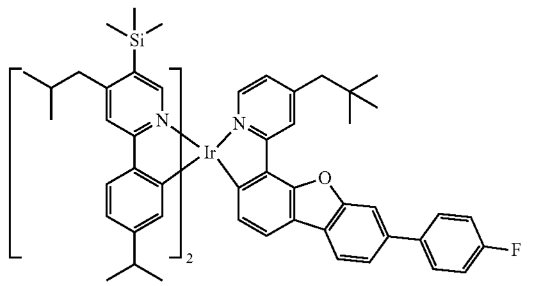
1467
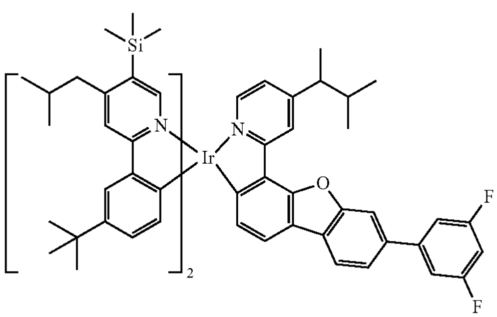
1468
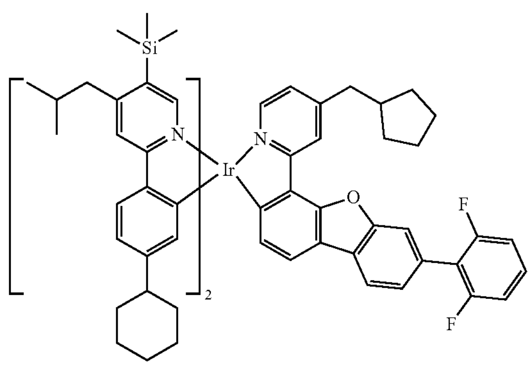
1469
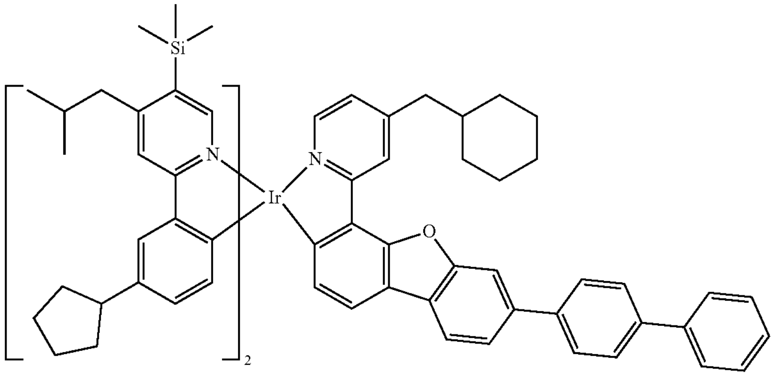

-continued
1470
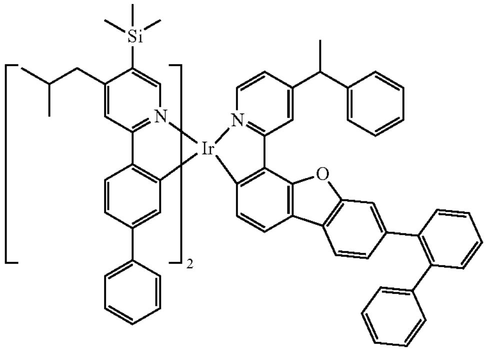
1471
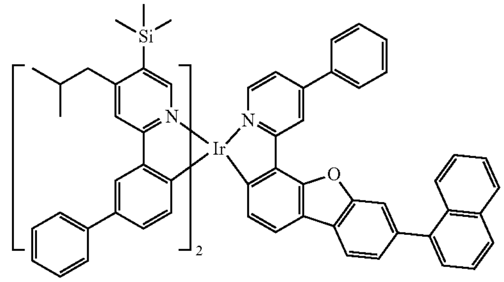
1472
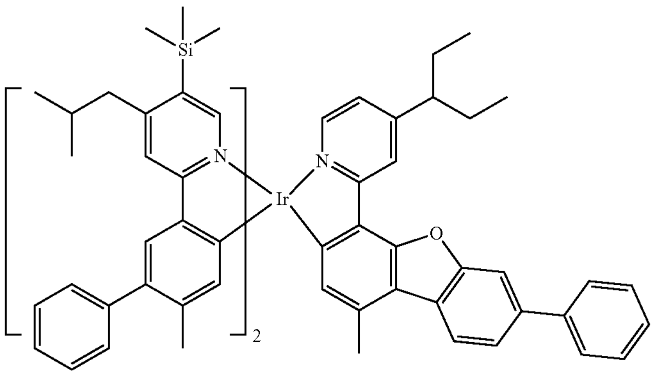
1473
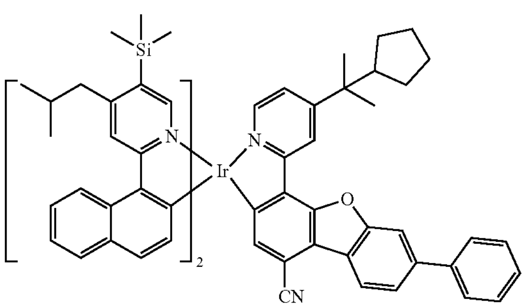
1474
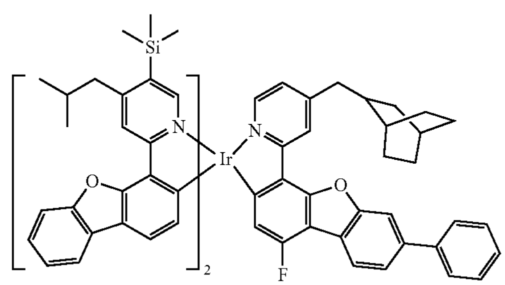
1475
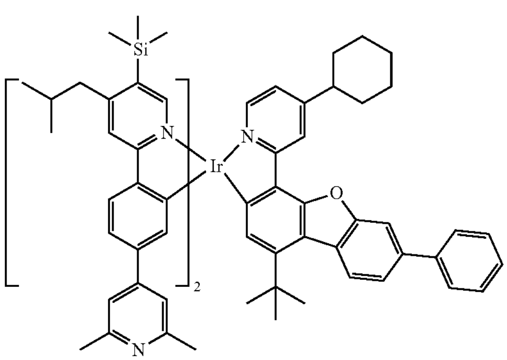
1476
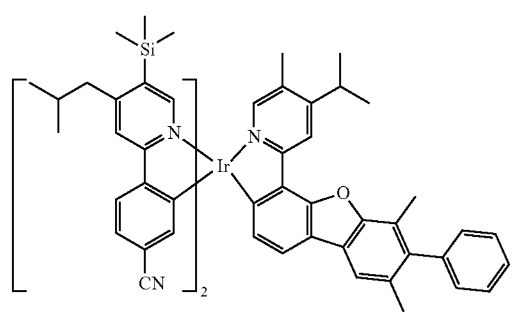

-continued
1477
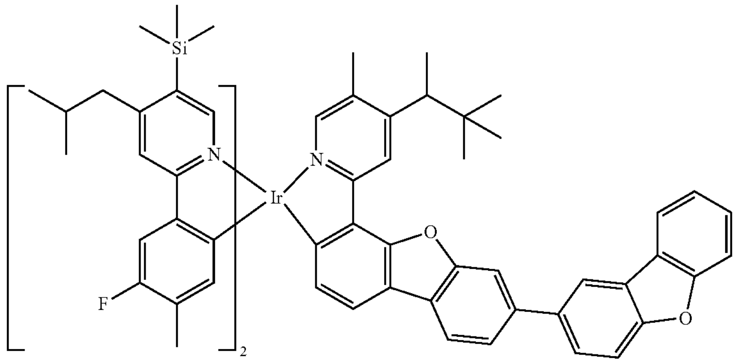
1478
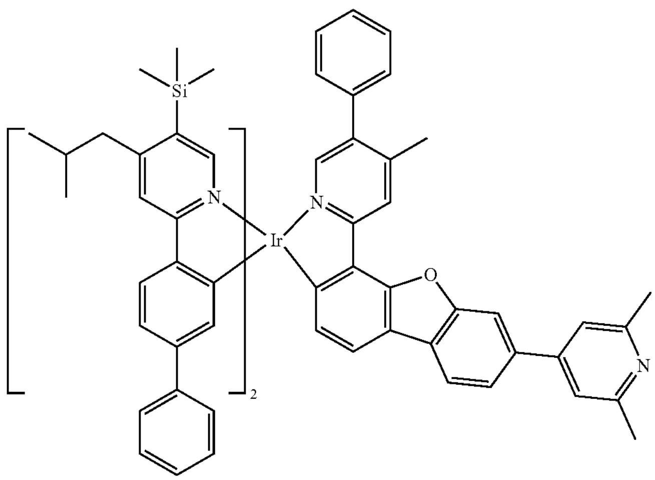
1479
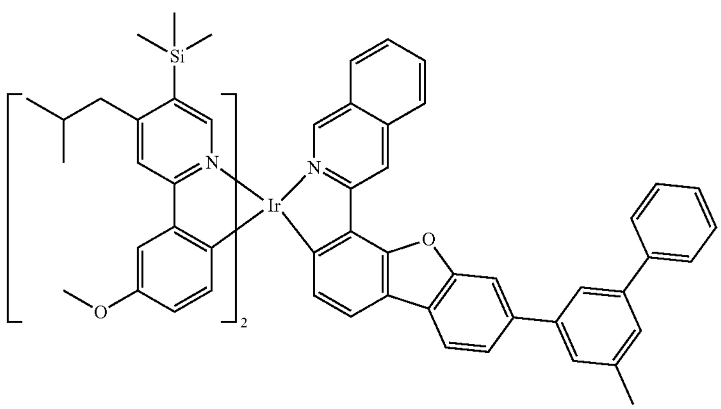
1480
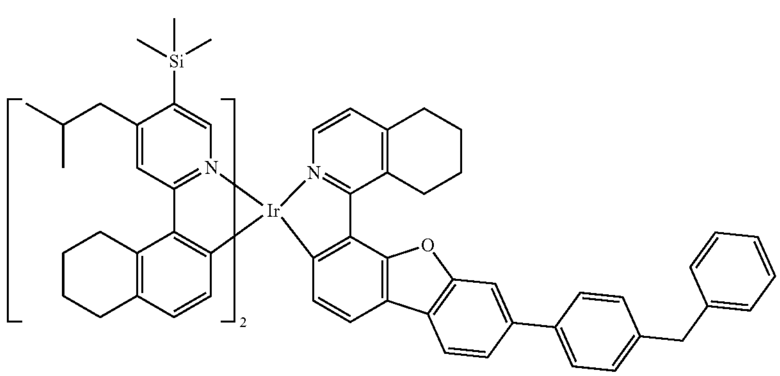

-continued
1481
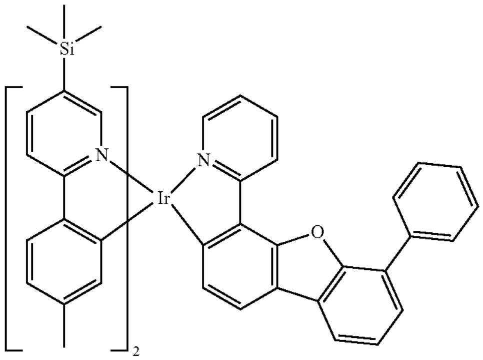
1482
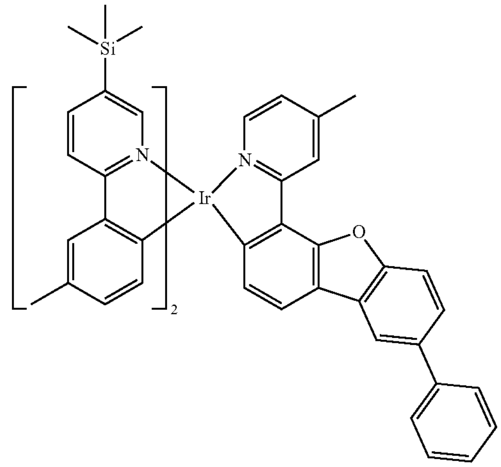
1483
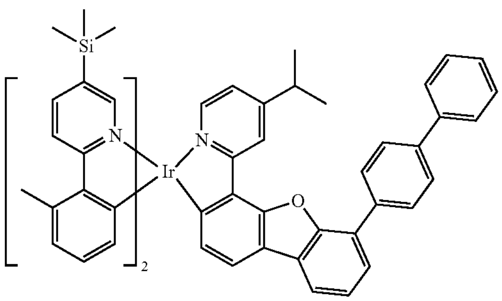
1484
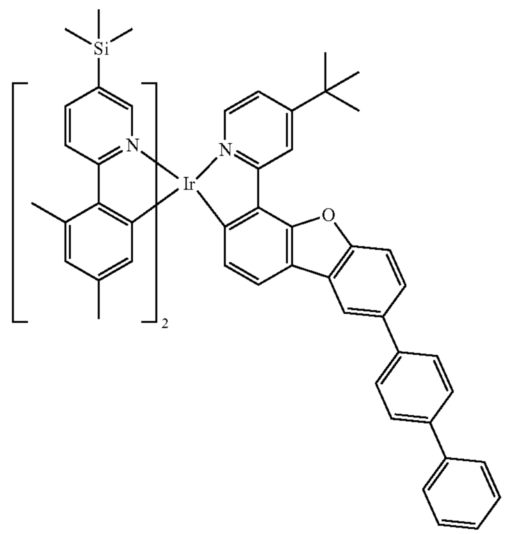
1485
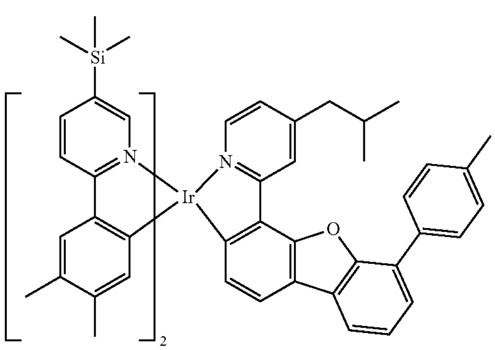
1486
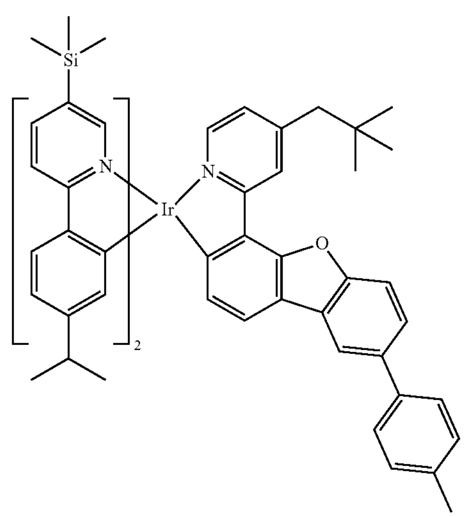

-continued
1487
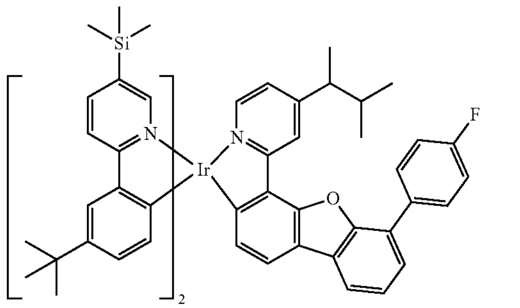
1488
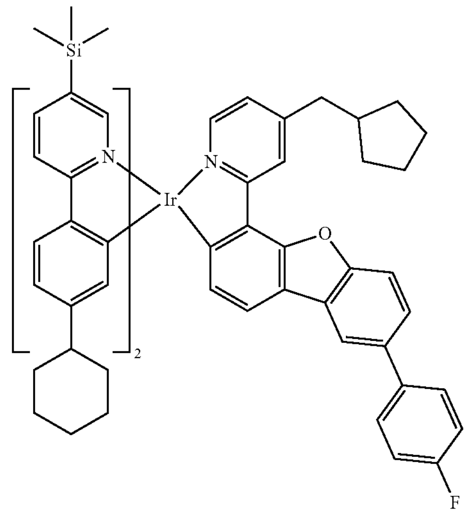
1489
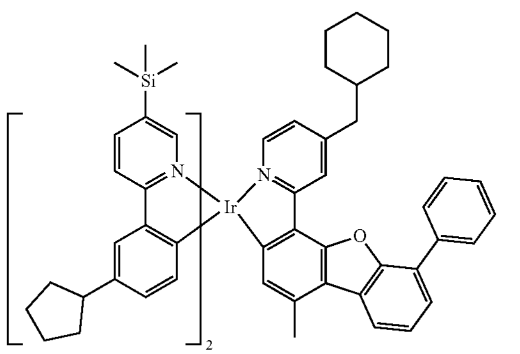
1490
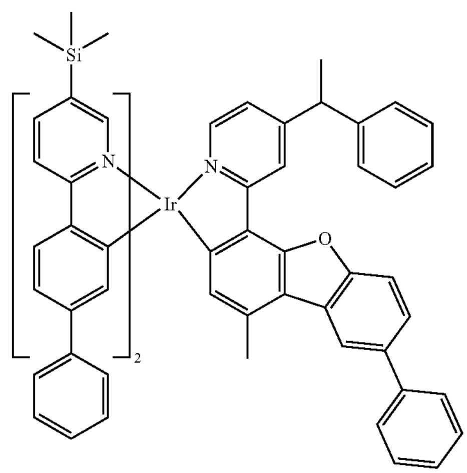
1491
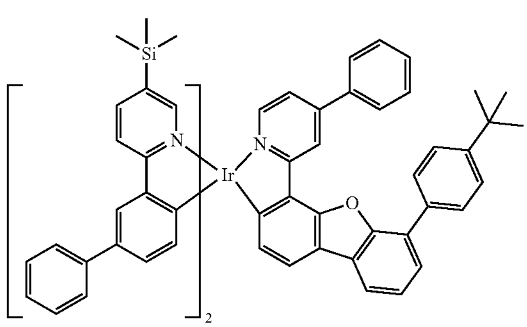
1492
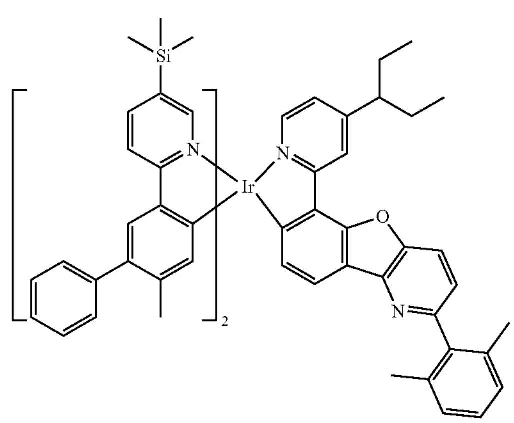

-continued
1493
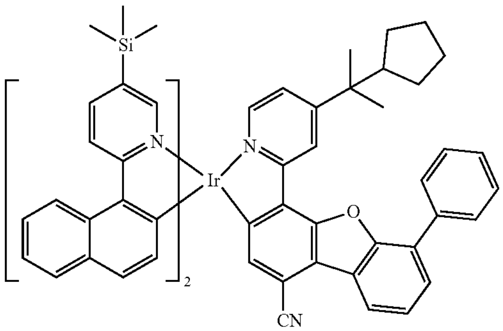
1494
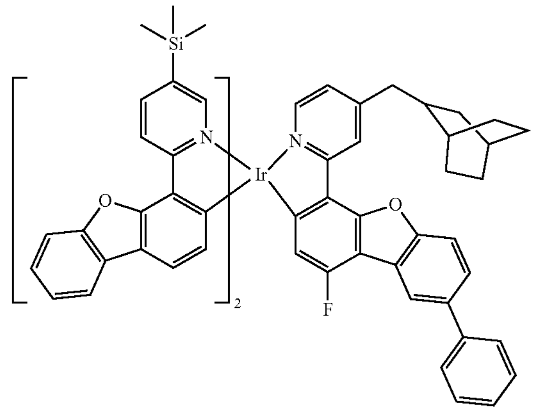
1495
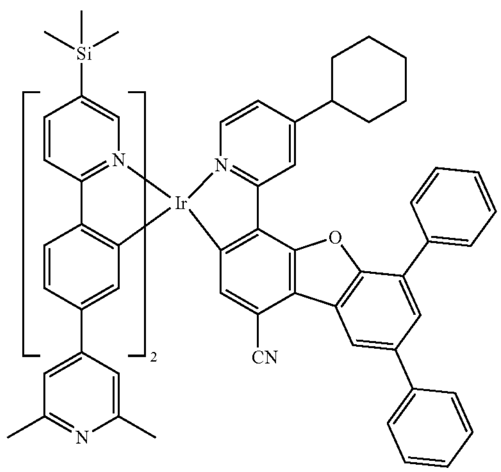
1496
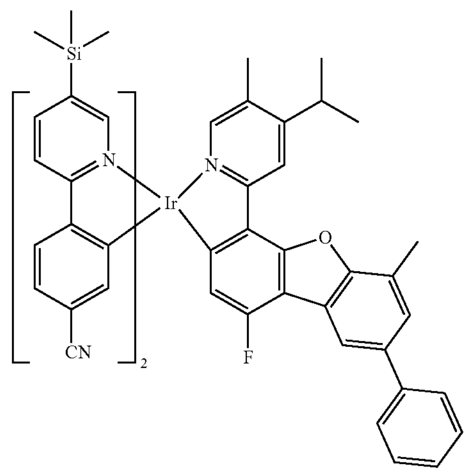
1497
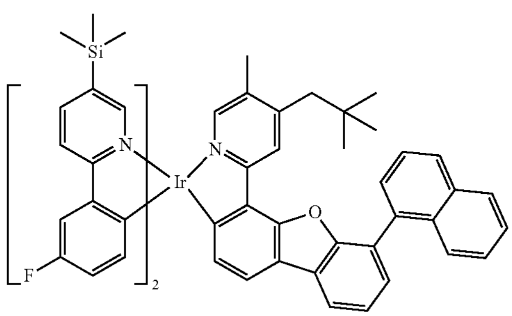
1498
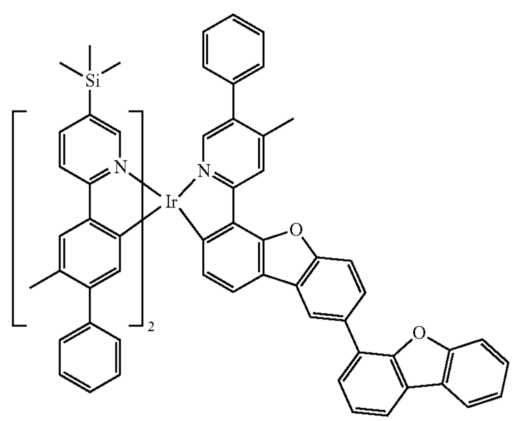

-continued
1499
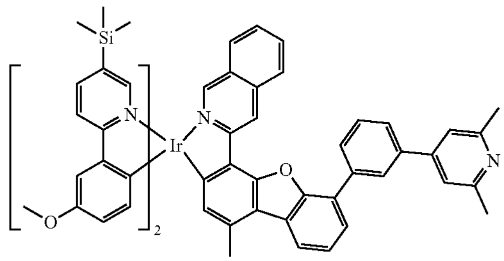
1500
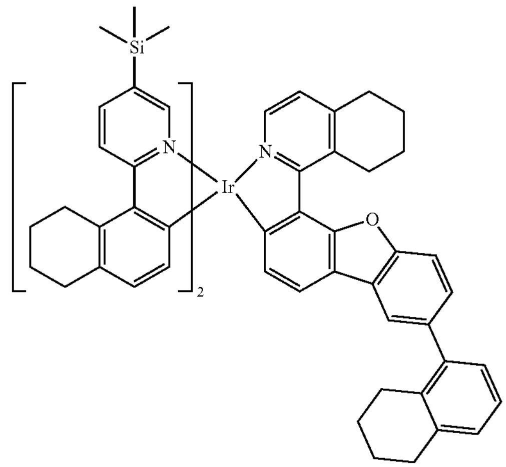
1501
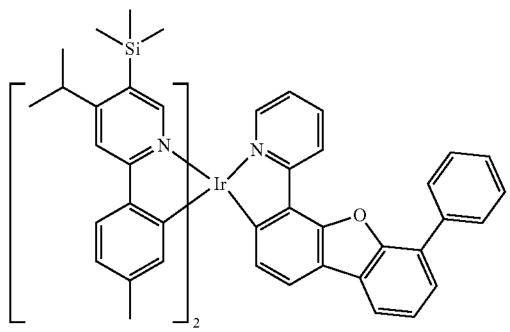
1502
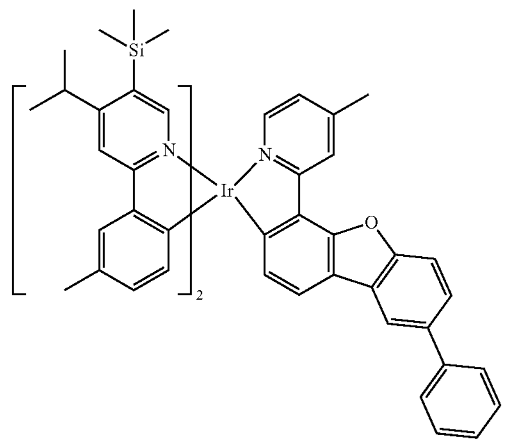
1503
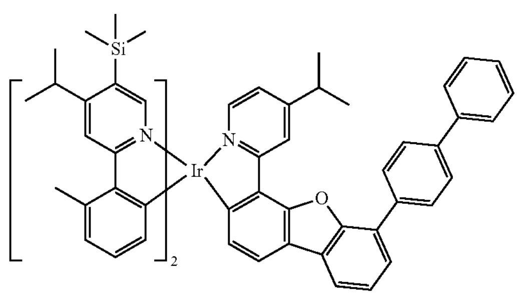
1504
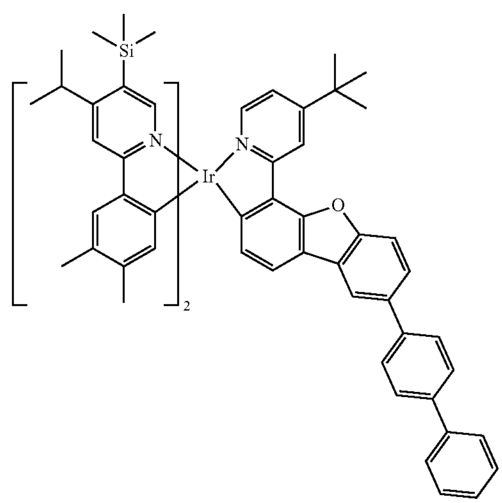

-continued
1505
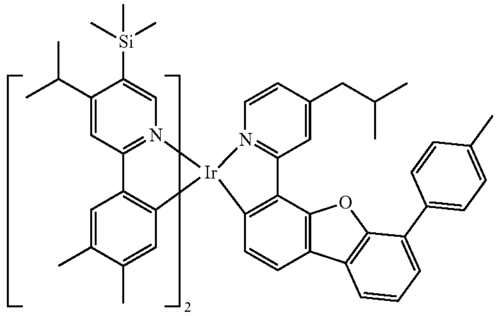
1506
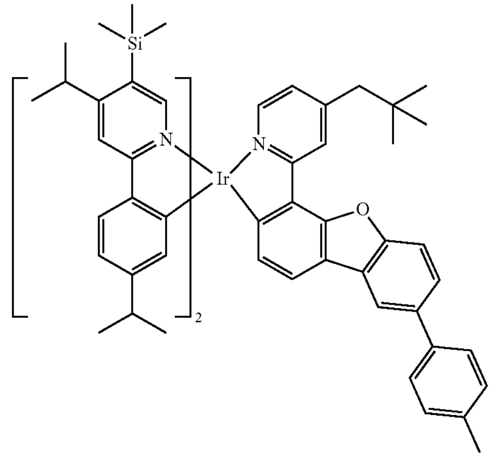
1507
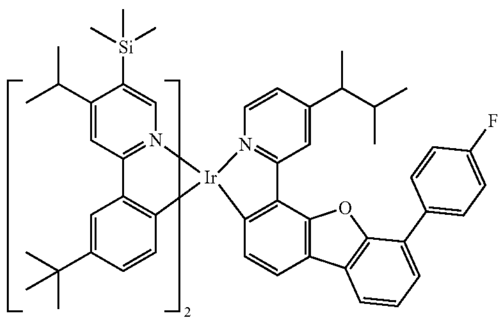
1508
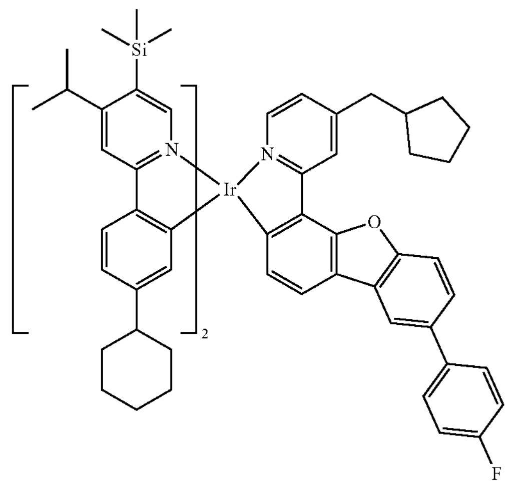
1509
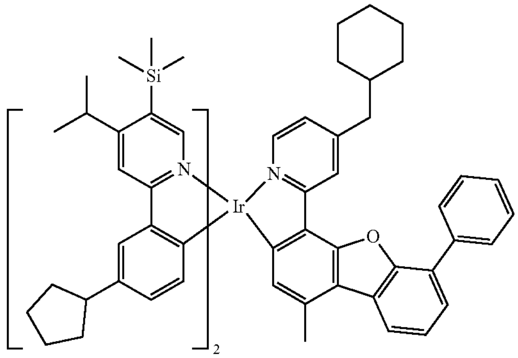
1510
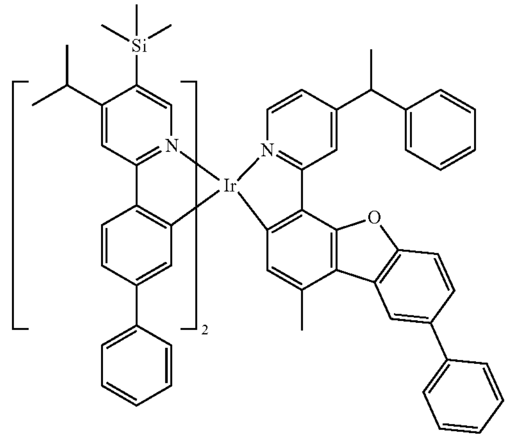

-continued
1511
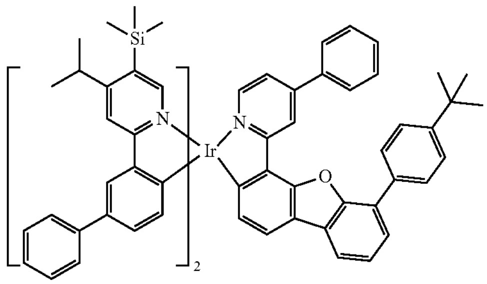
1512
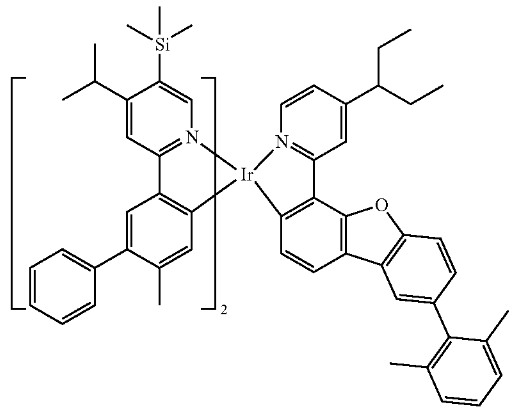
1513
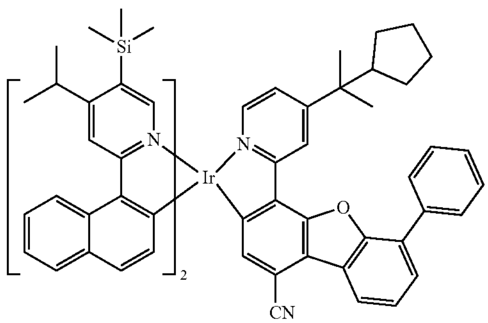
1514
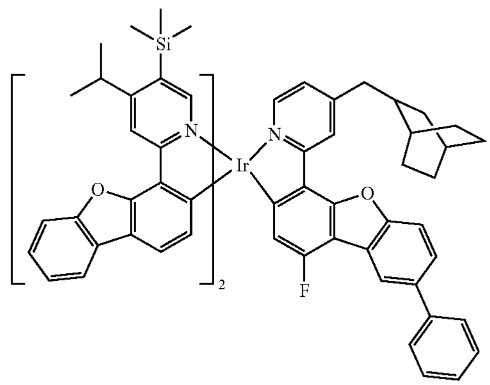
1515
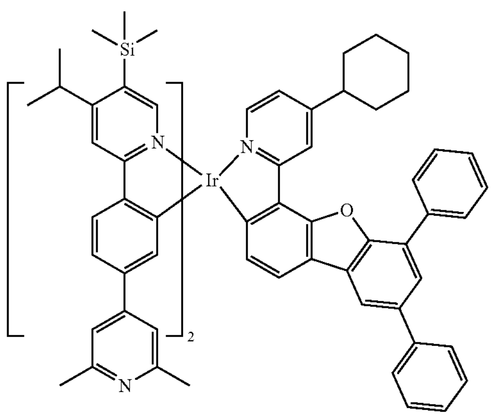
1516
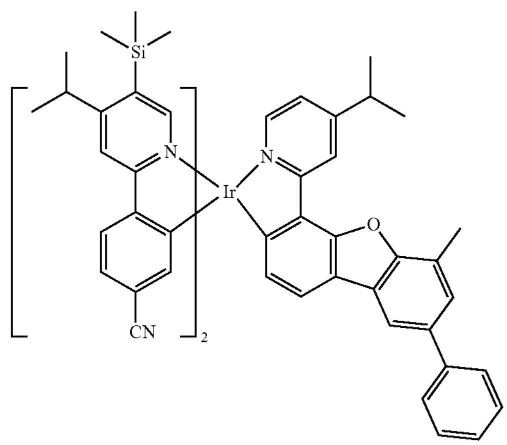
1517
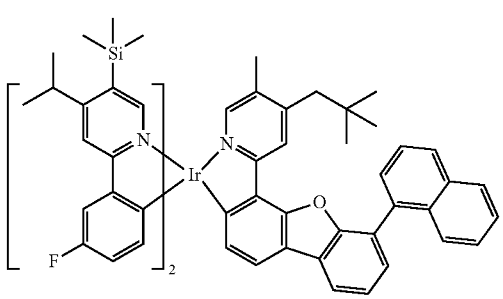
1518
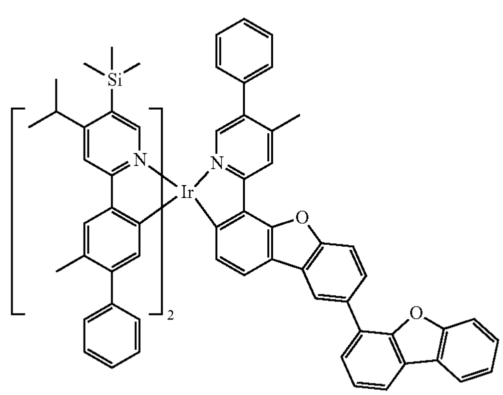

-continued
1519
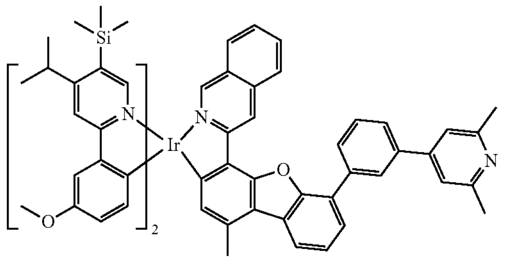
1520
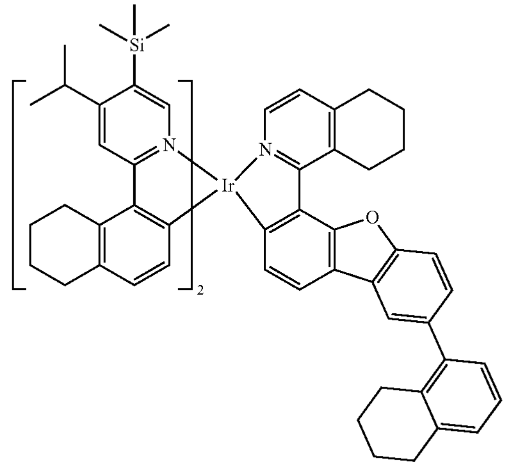
1521
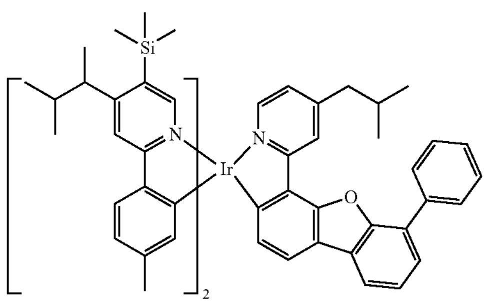
1522
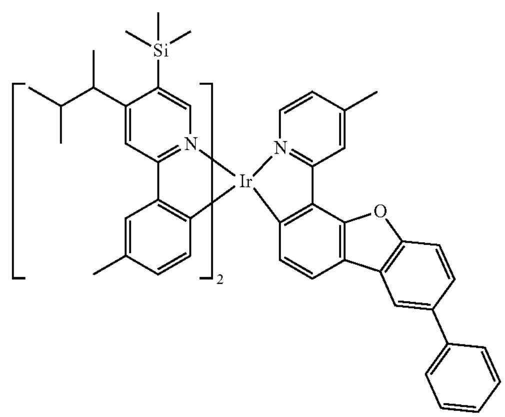
1523
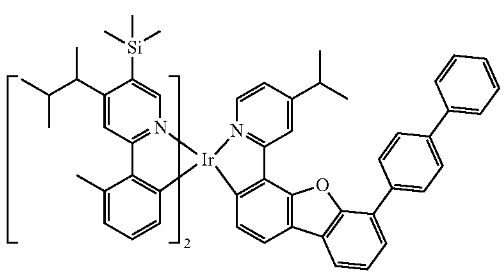
1524
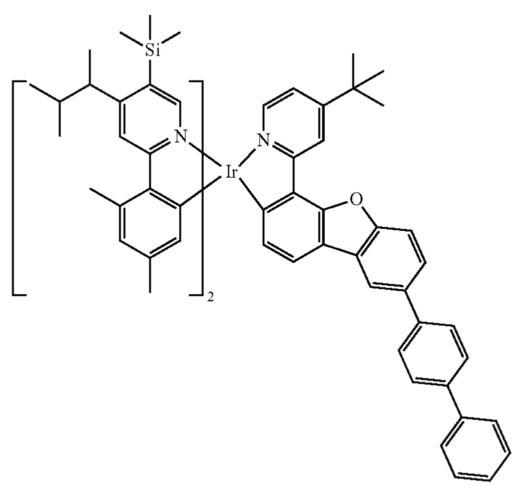

-continued
1525
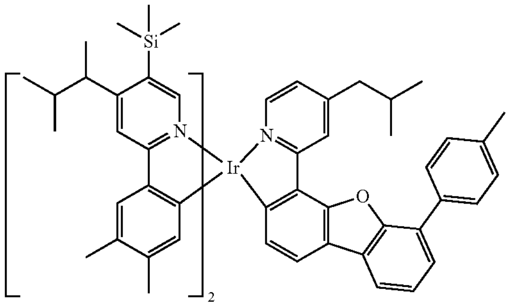
1526
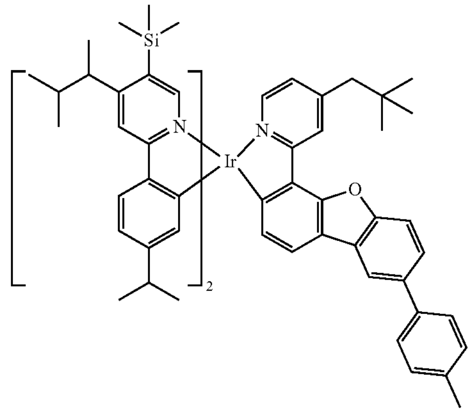
1527
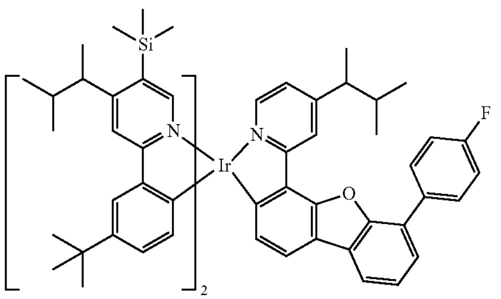
1528
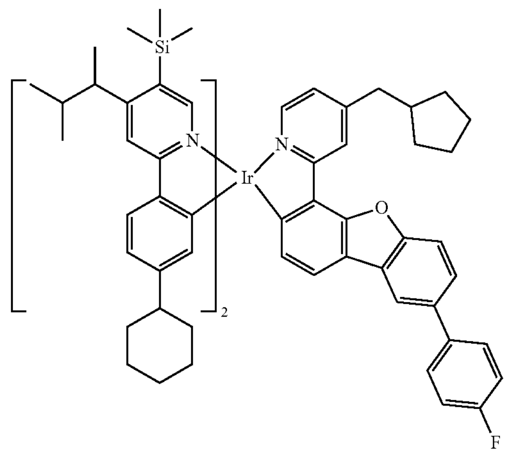
1529
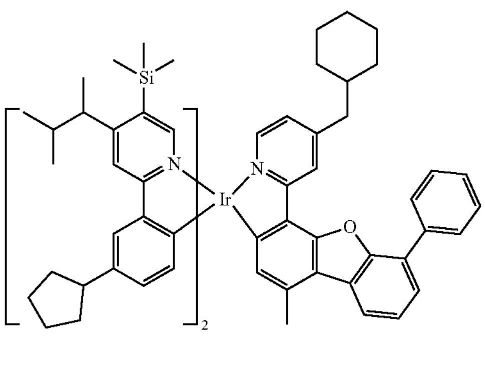
1530
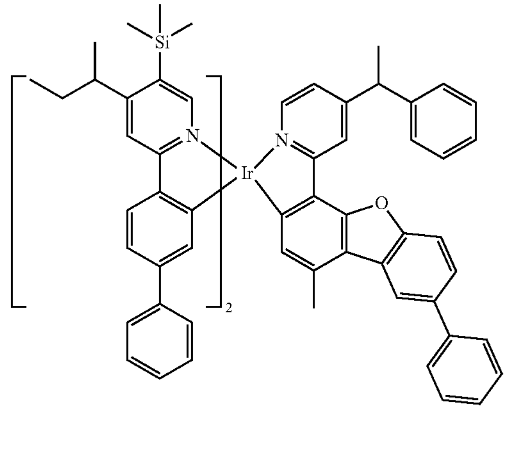

-continued
1531
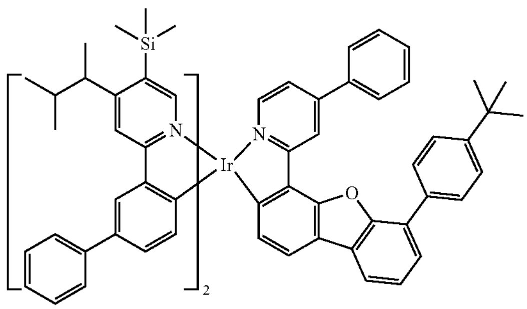
1532
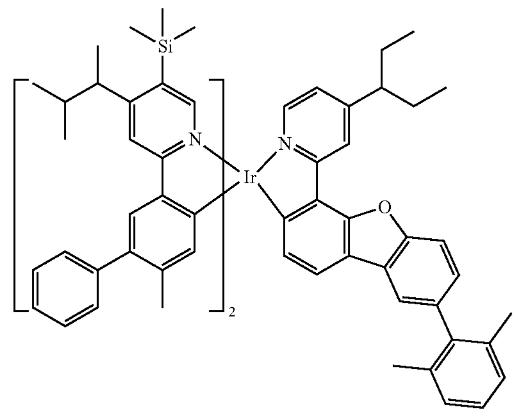
1533
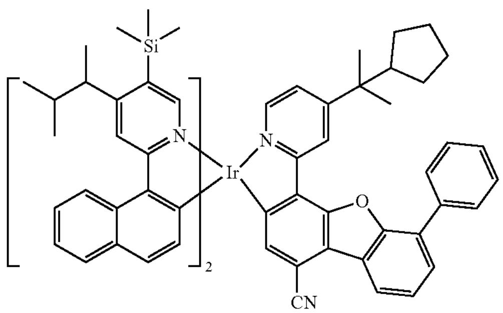
1534
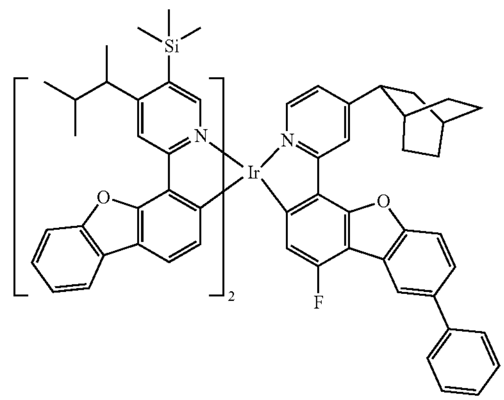
1535
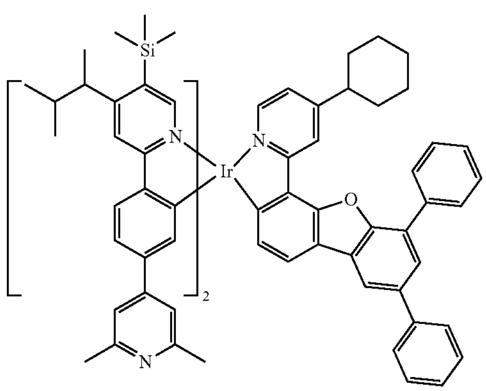
1536
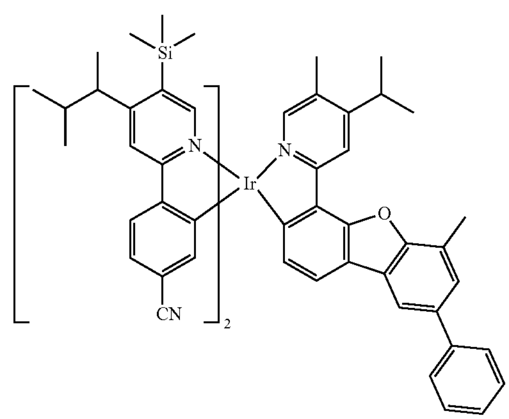
1537
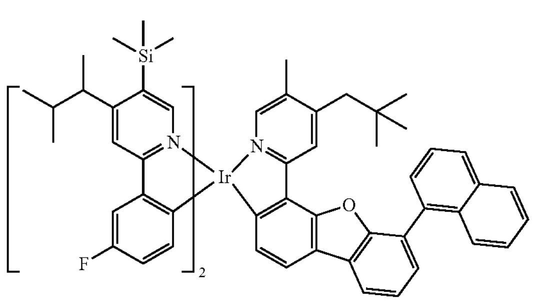
1538
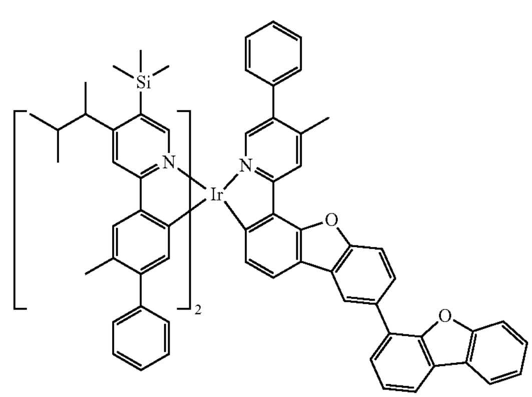

-continued
1539
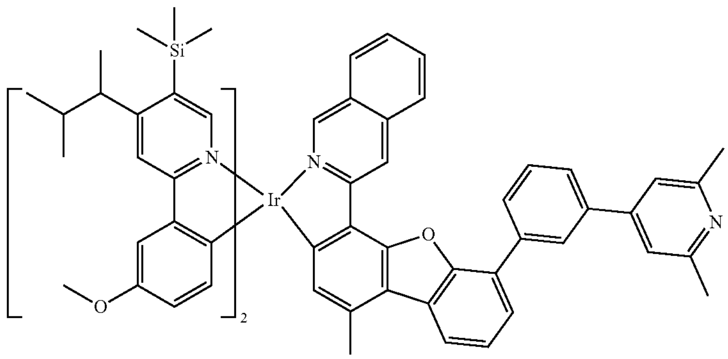
1540
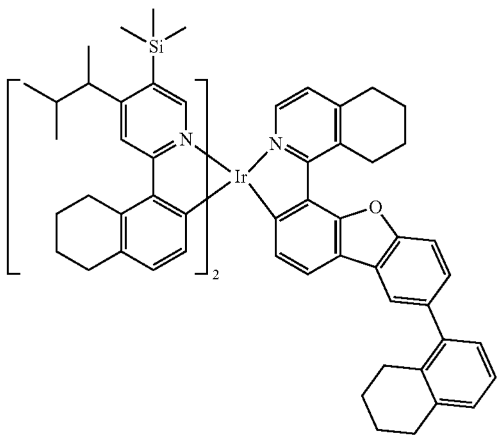
1541
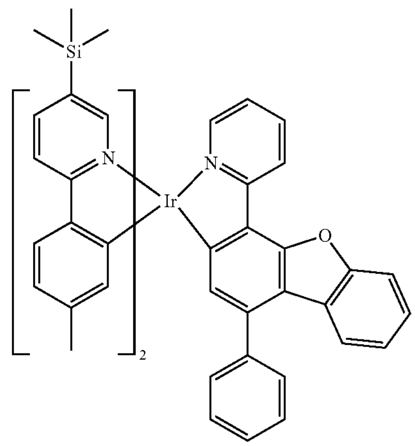
1542
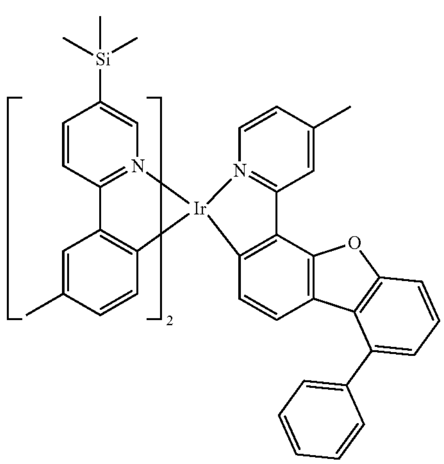
1543
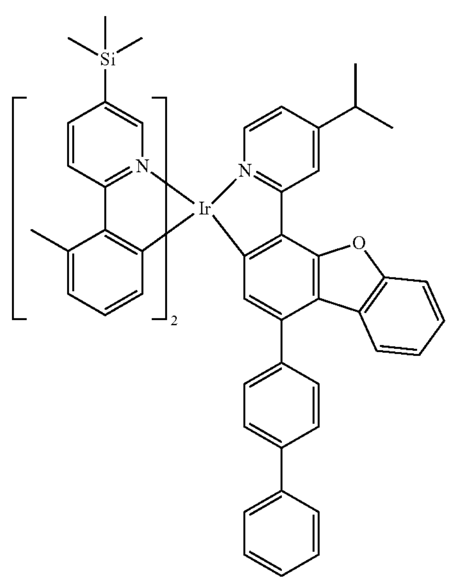

-continued
1544
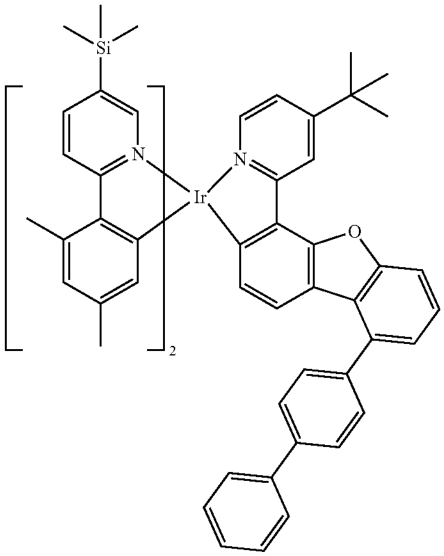
1545
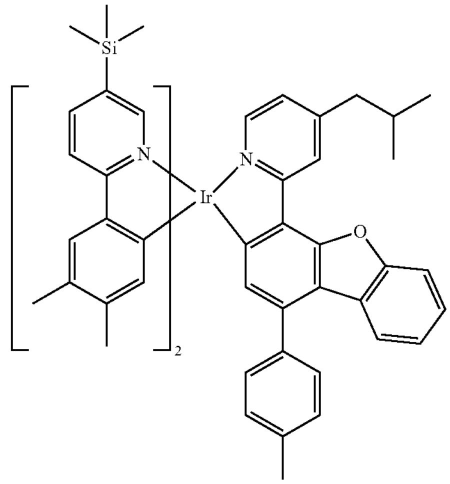
1546
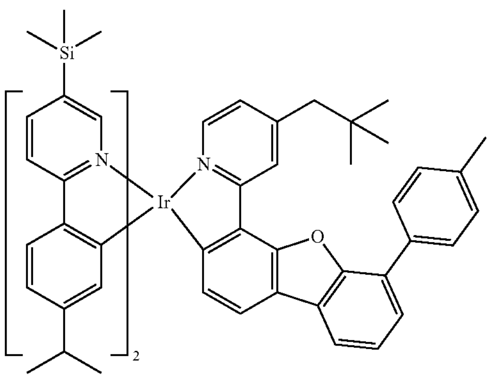
1547
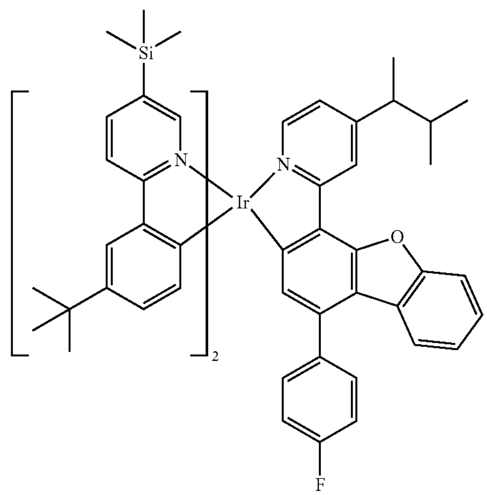
1548
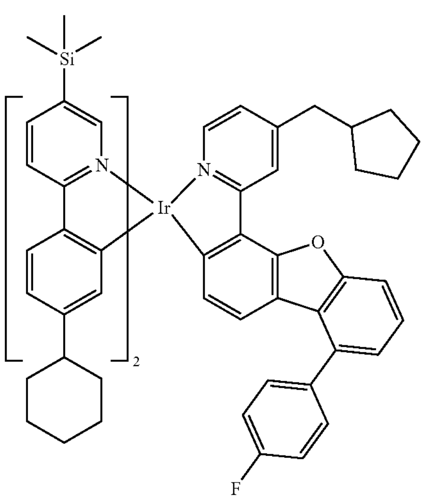
1549
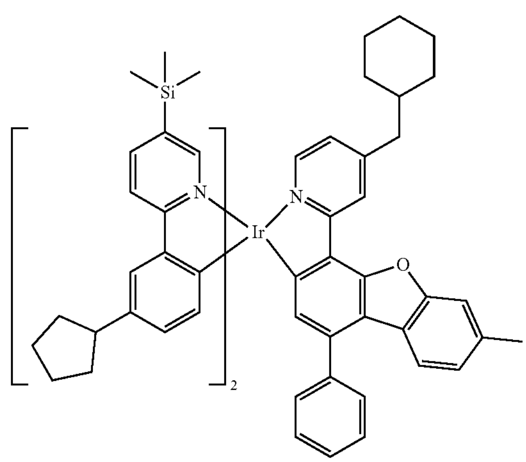

-continued
1550
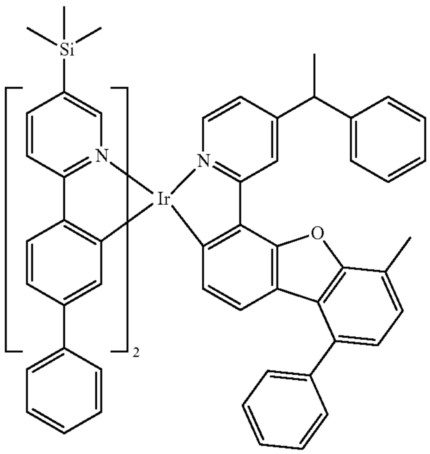
1551
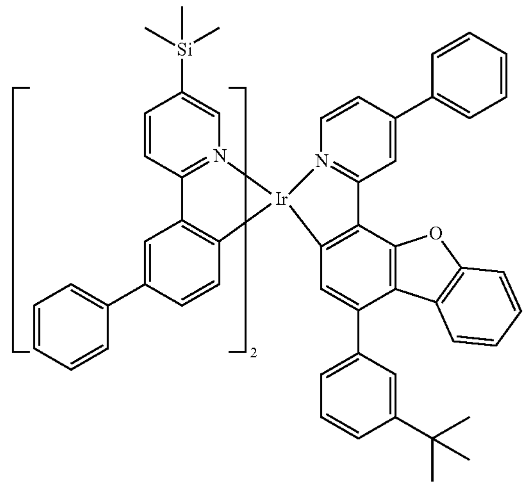
1552
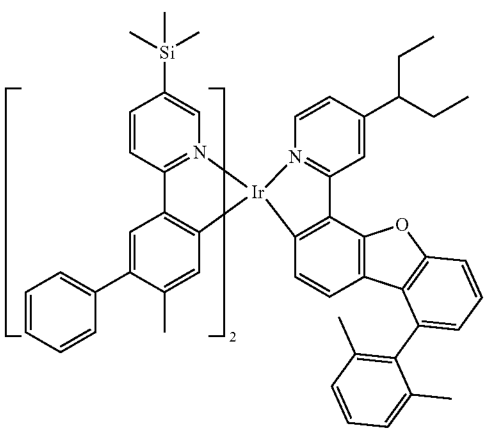
1553
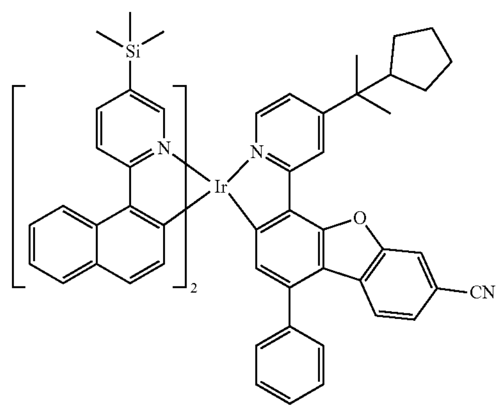
1554
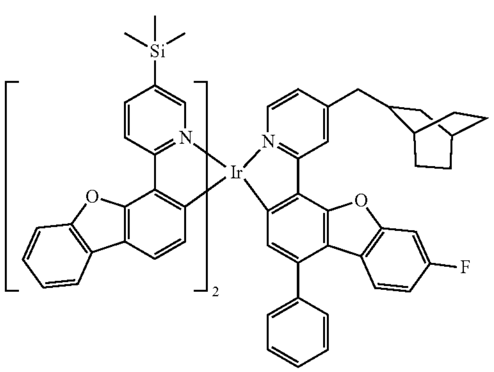
1555
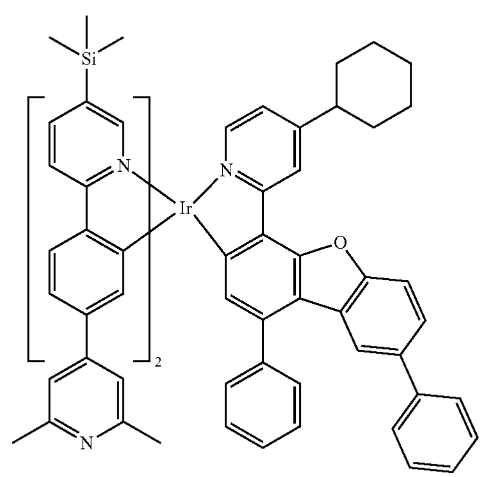

-continued
1556
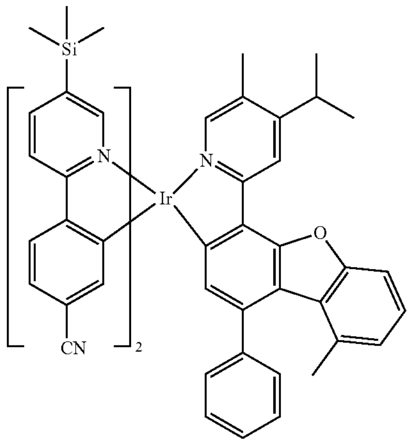
1557
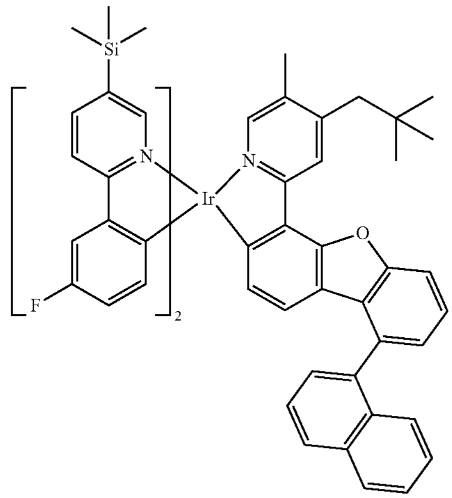
1558
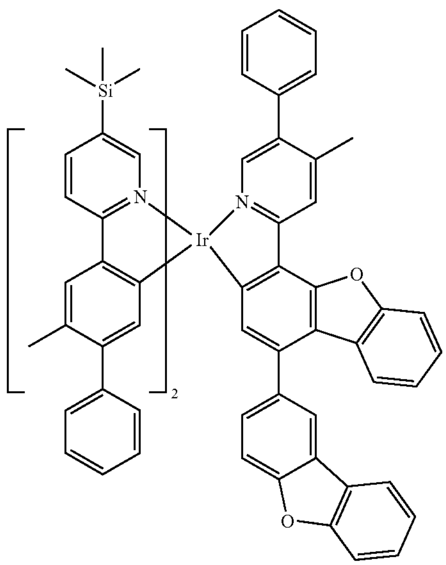
1559
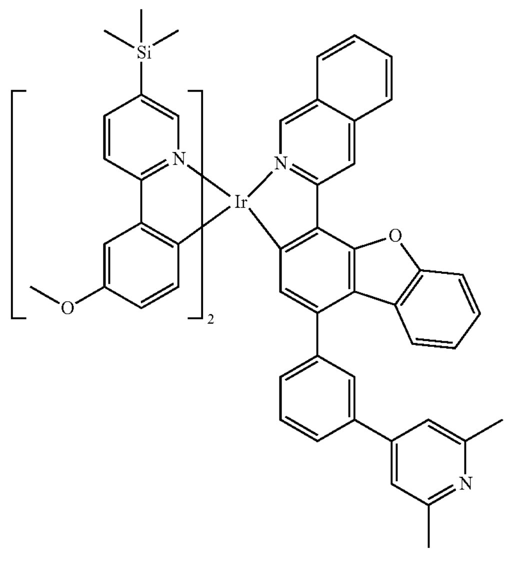
1560
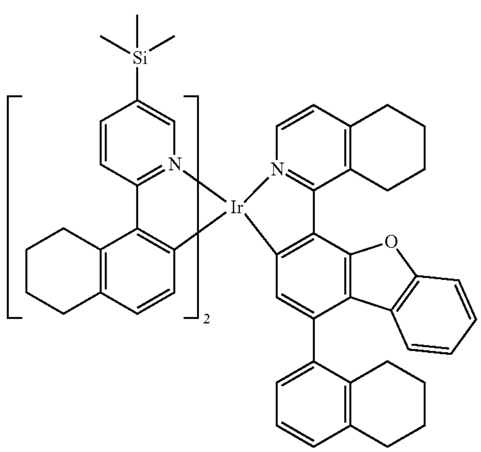
1561
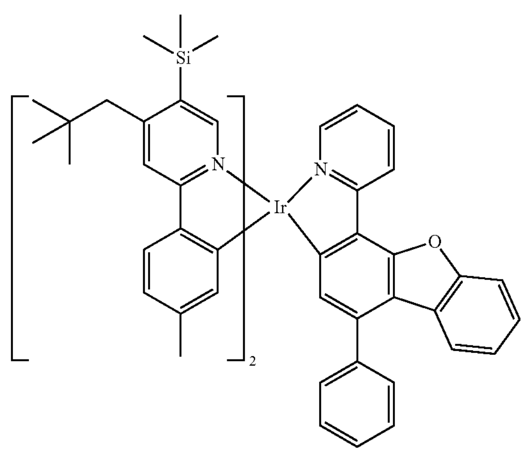

-continued
1562
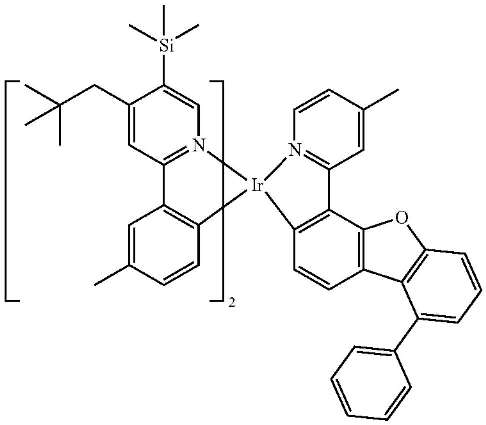
1563
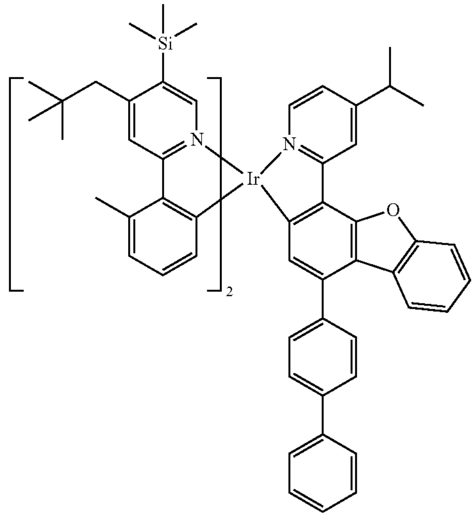
1564
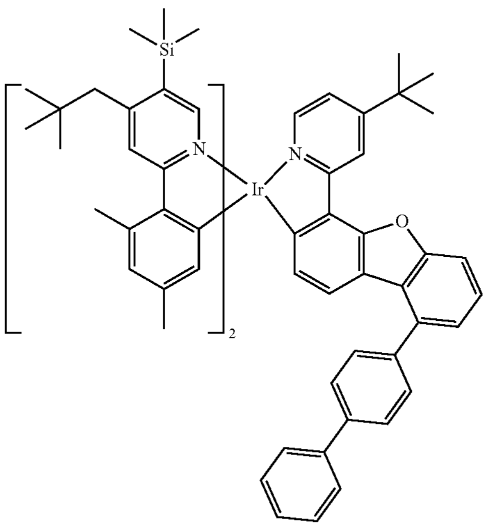
1565
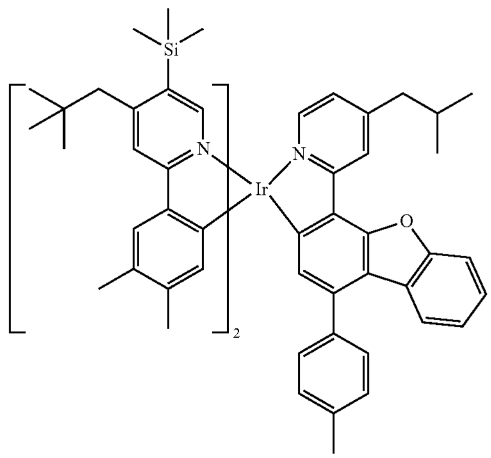
1566
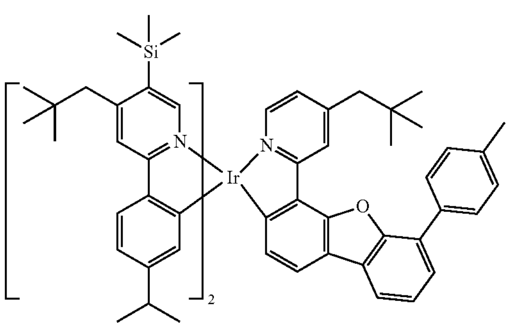
1567
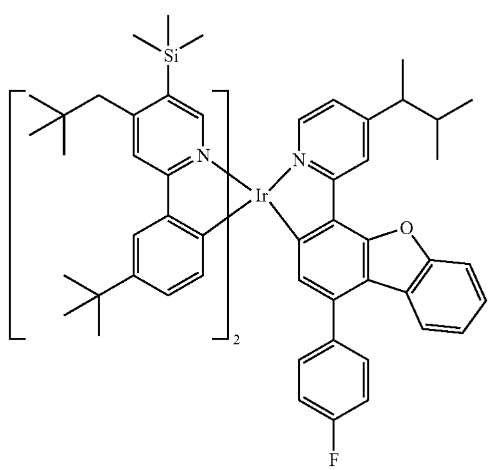

-continued
1568
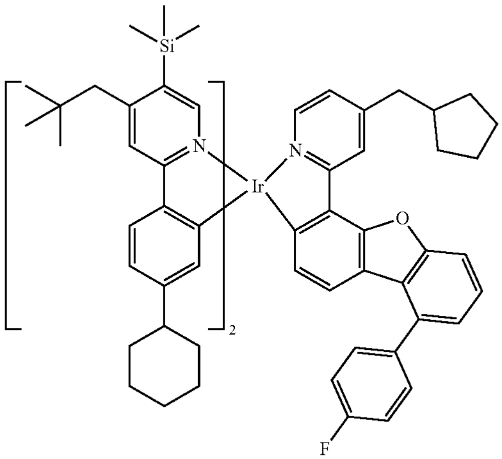
1569
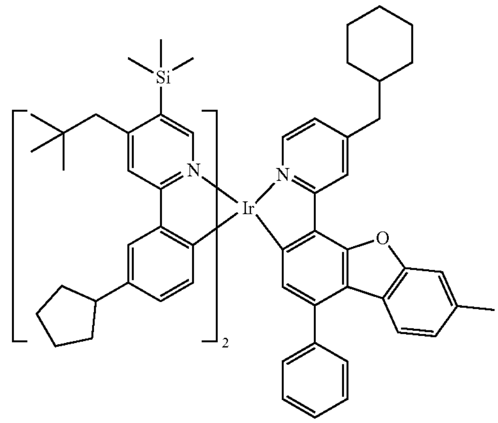
1570
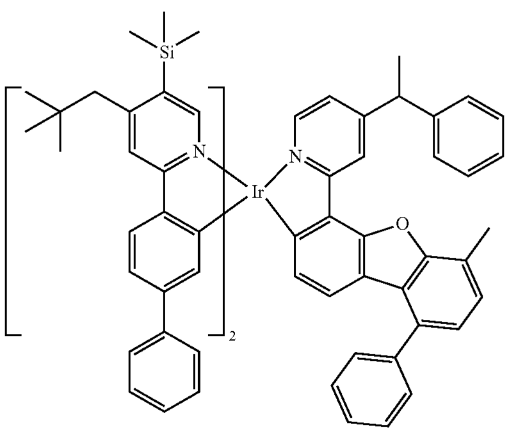
1571
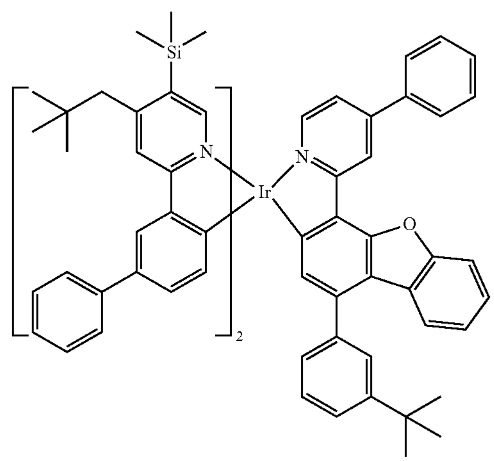
1572.
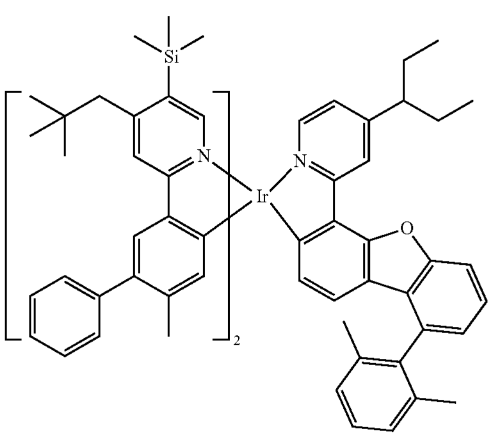
1573
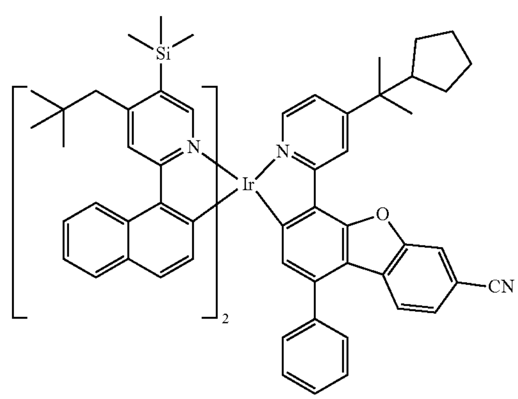

-continued
1574
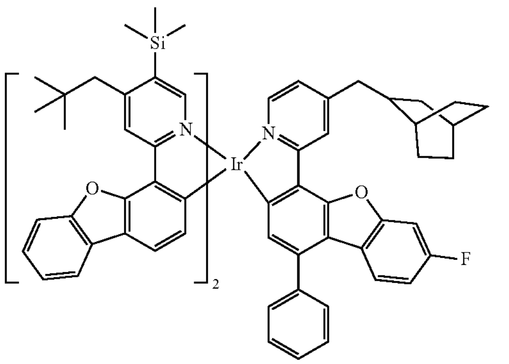
1575
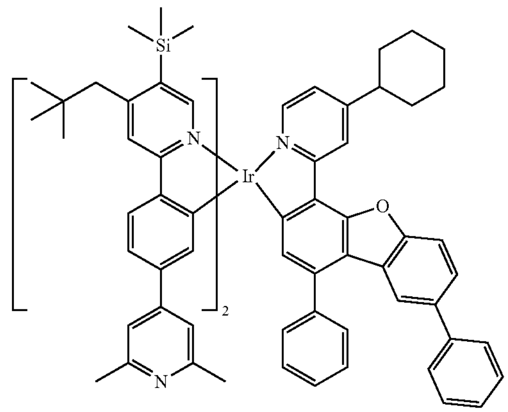
1576
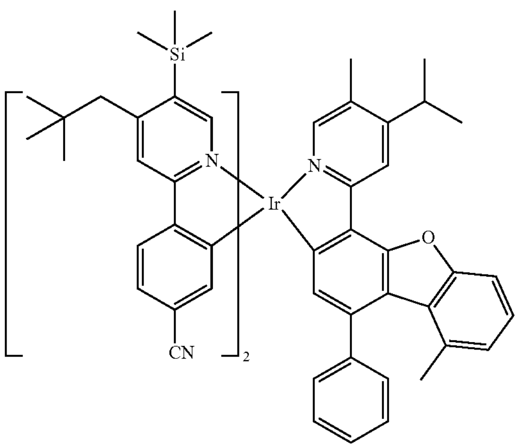
1577
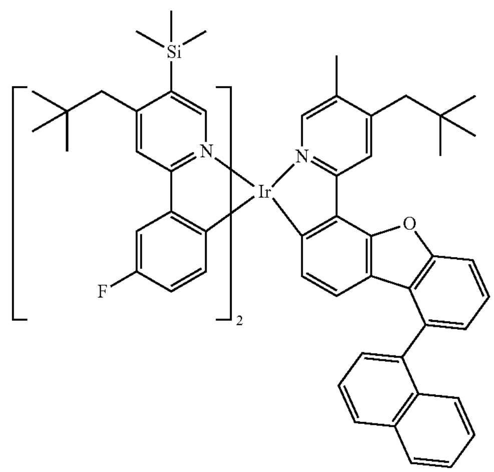
1578
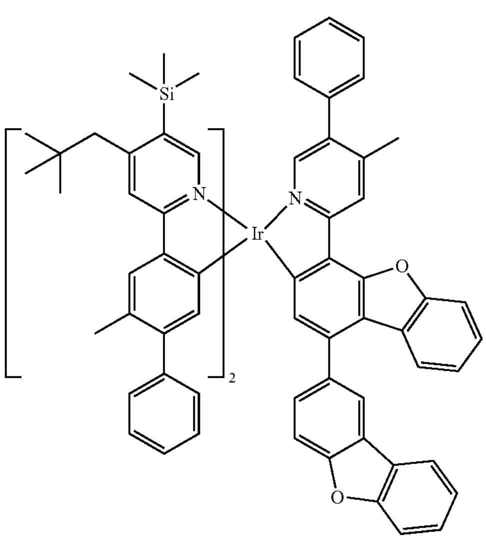
1579
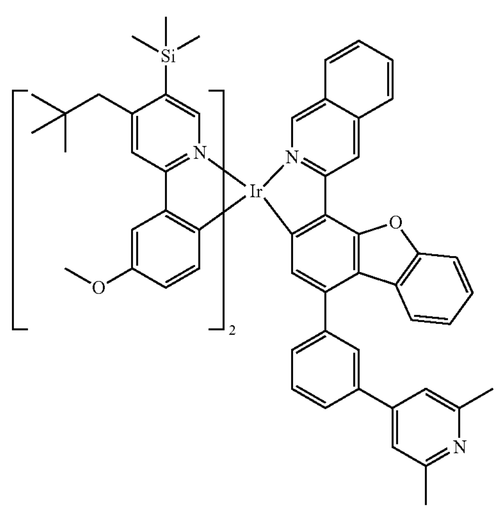

-continued
1580
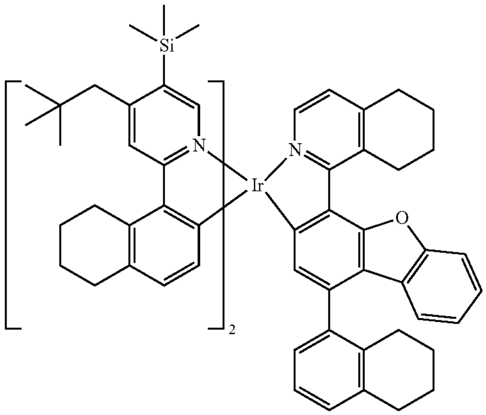
1581
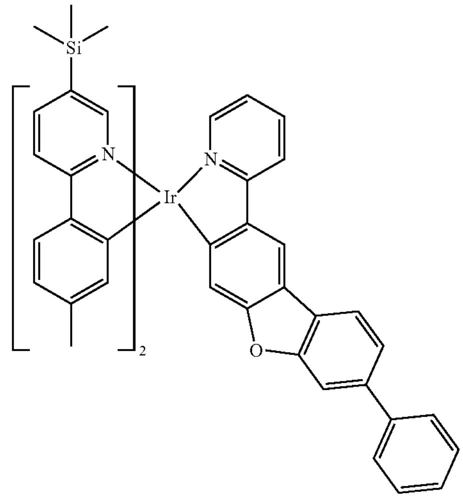
1582
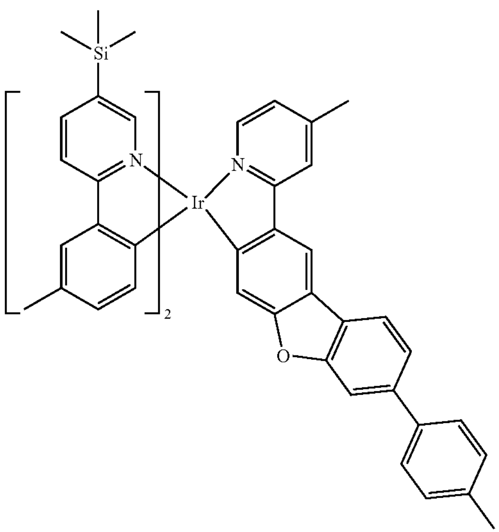
1583
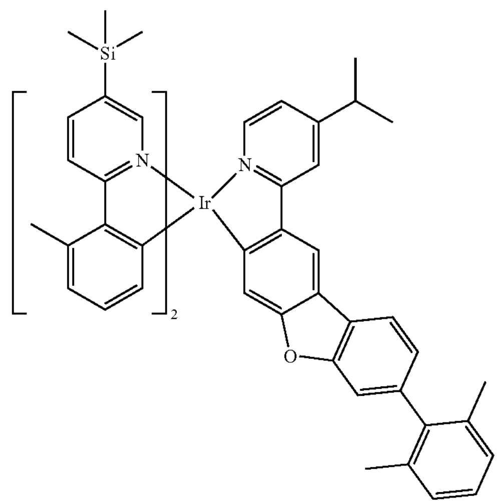
1584
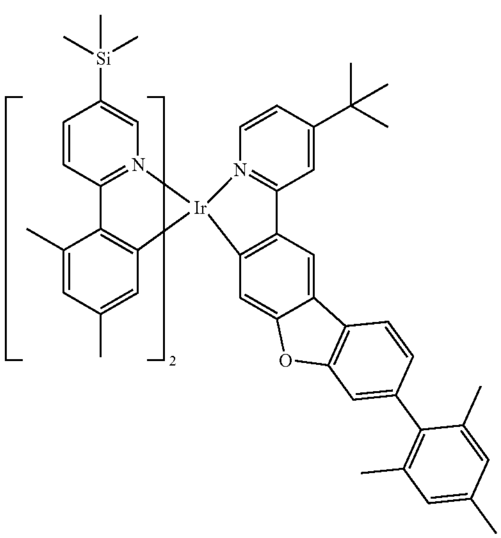
1585
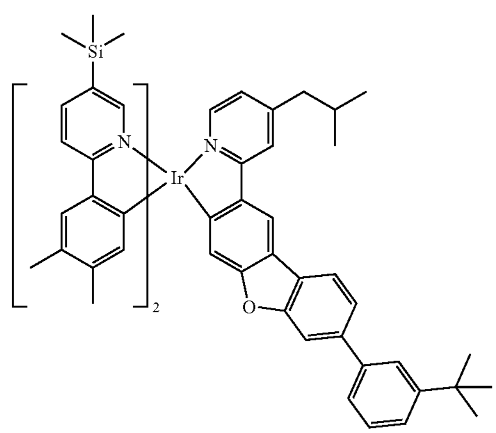

-continued
1586
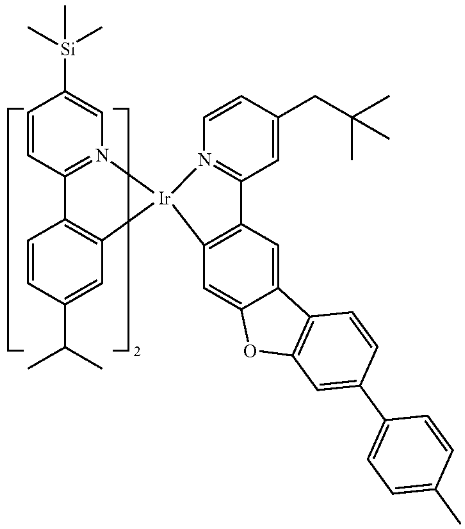
1587
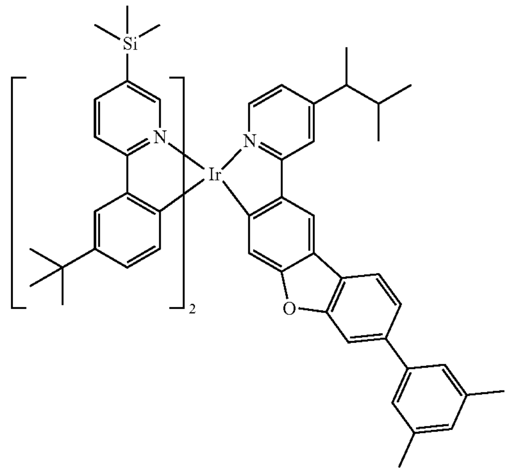
1588
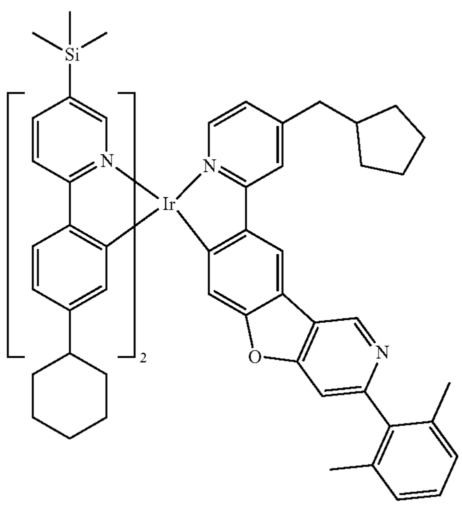
1589
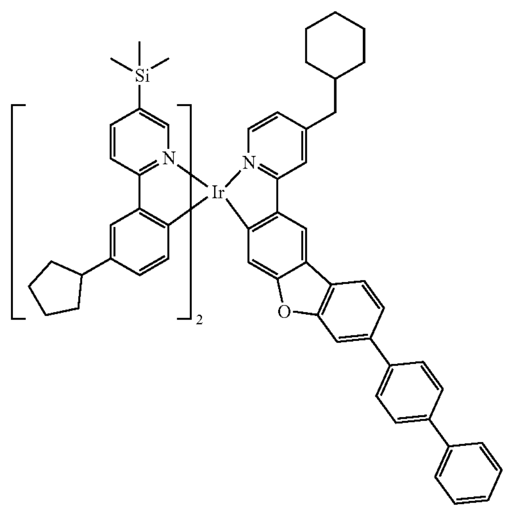
1590
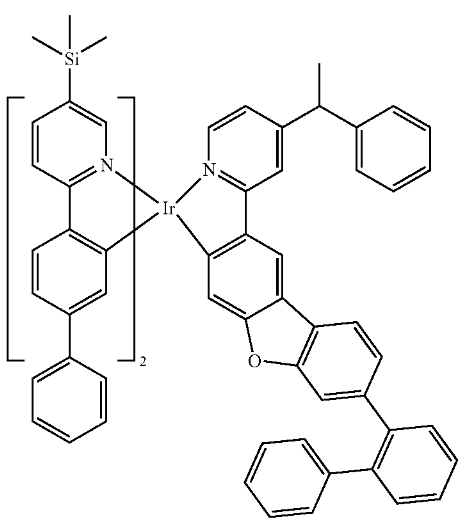
1591
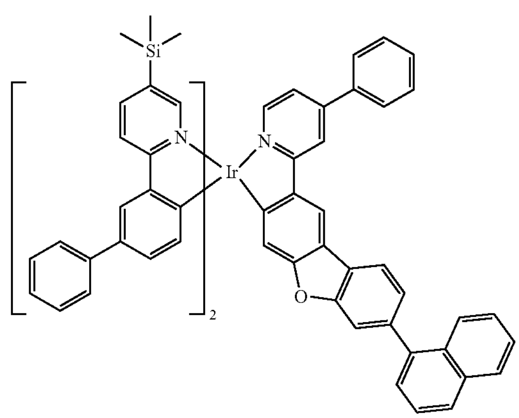

-continued
1592
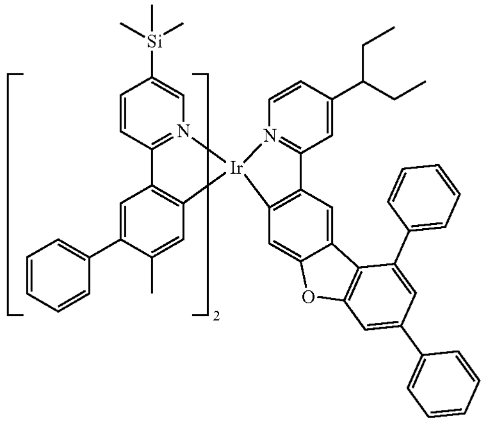
1593
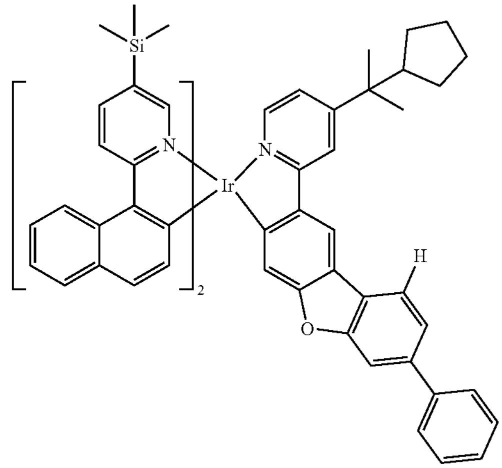
1594
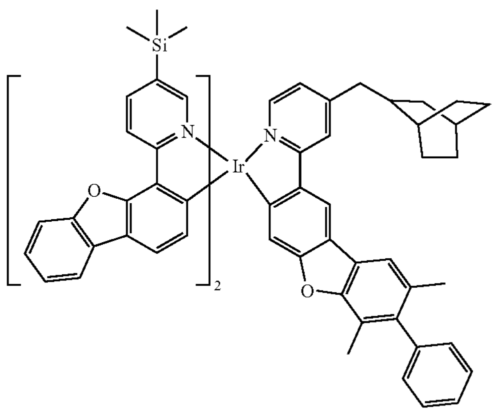
1595
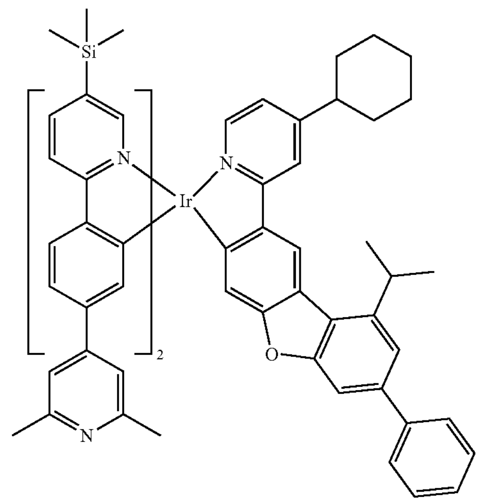
1596
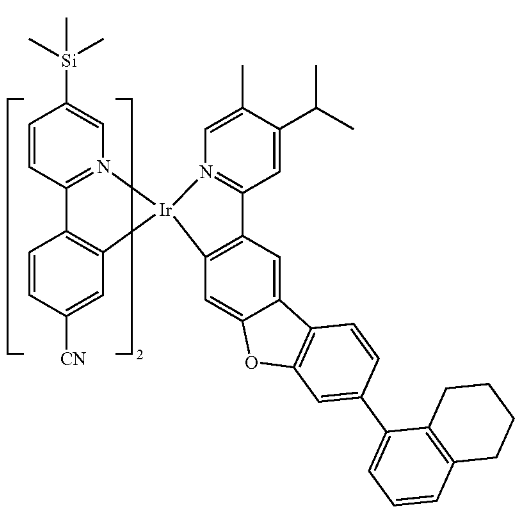
1597
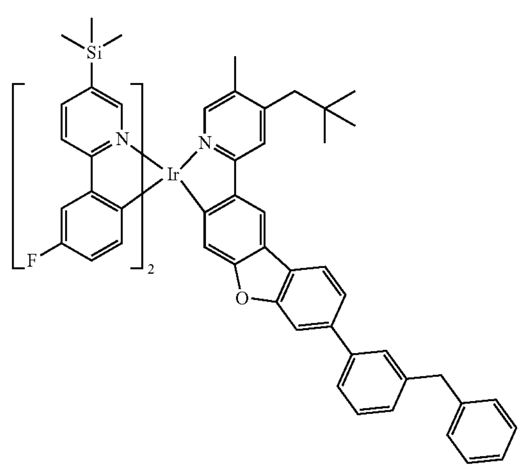

-continued
1598
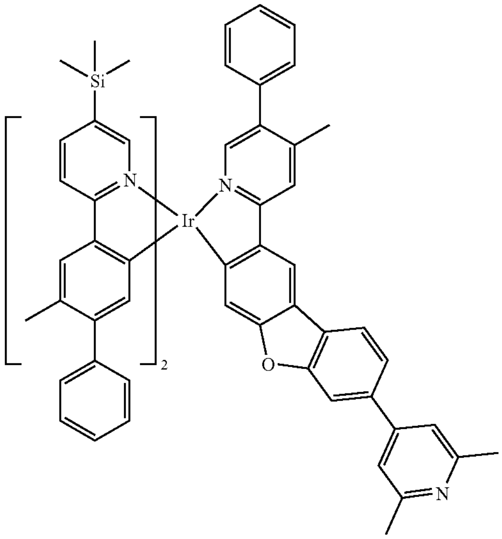
1599
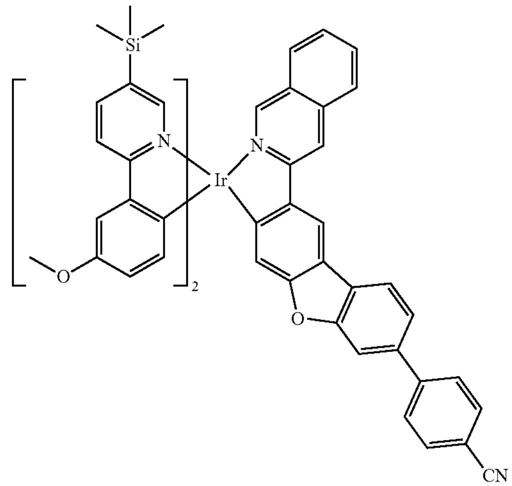
1600
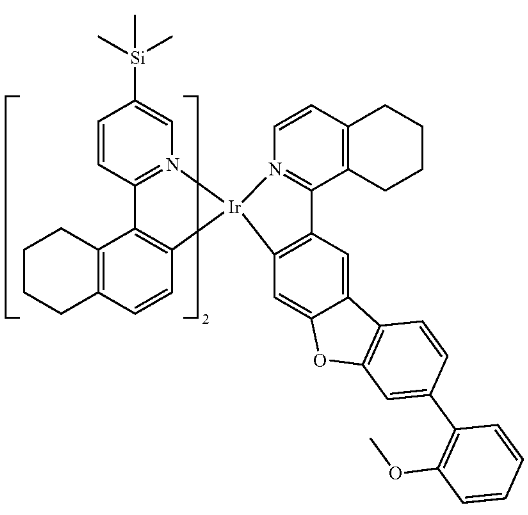

-continued
1601
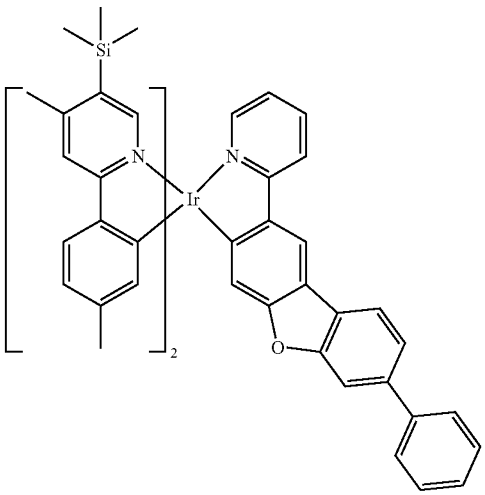
1602
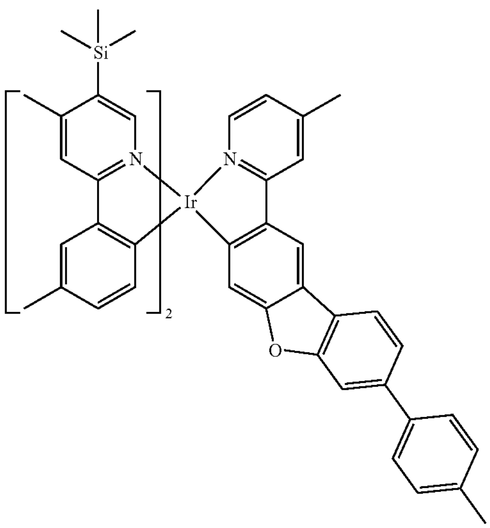
1603
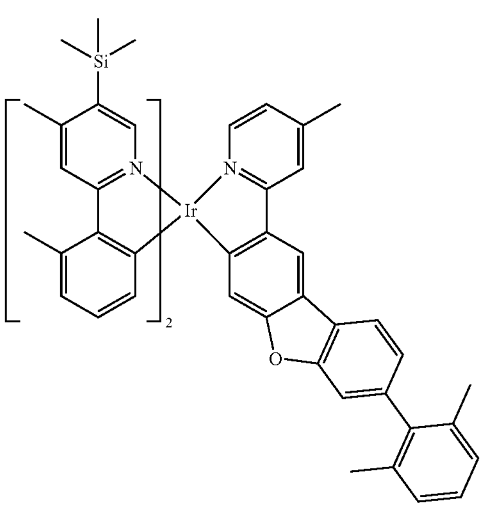
1604
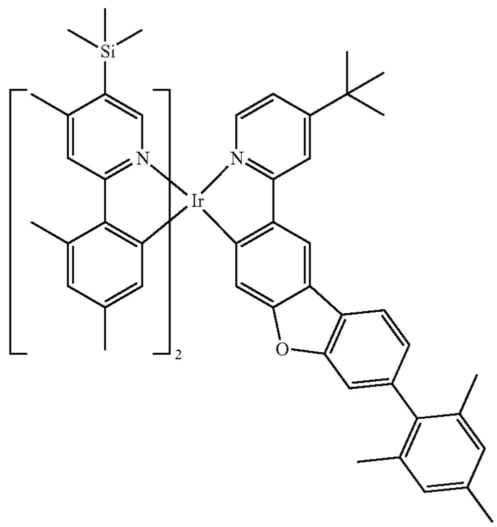
1605
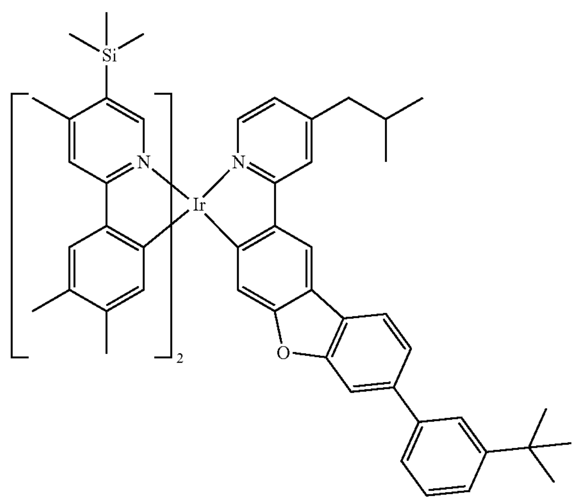
1606
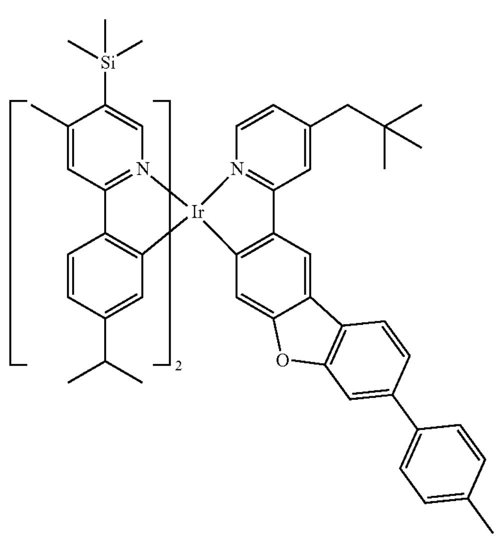

-continued
1607
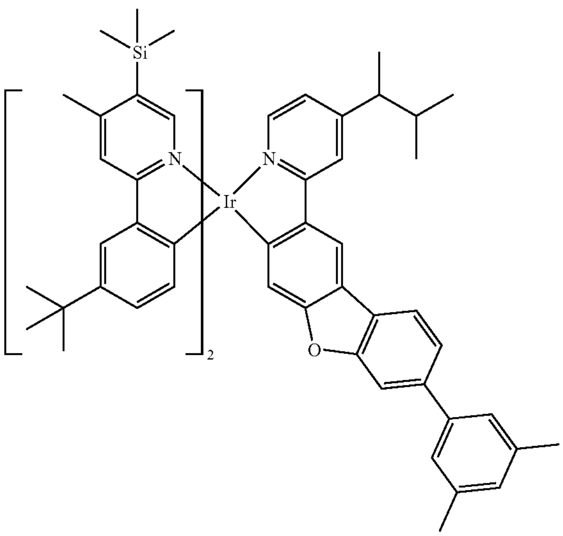
1608
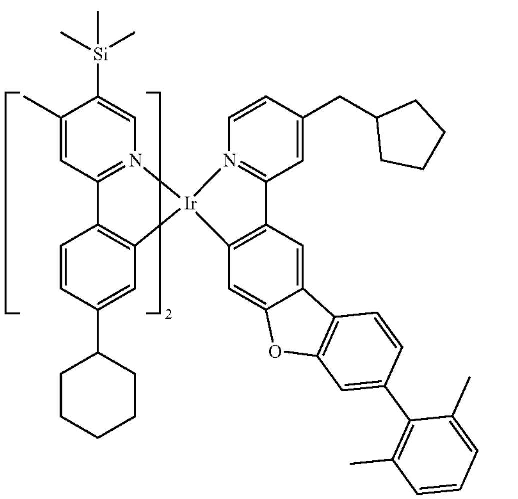
1609
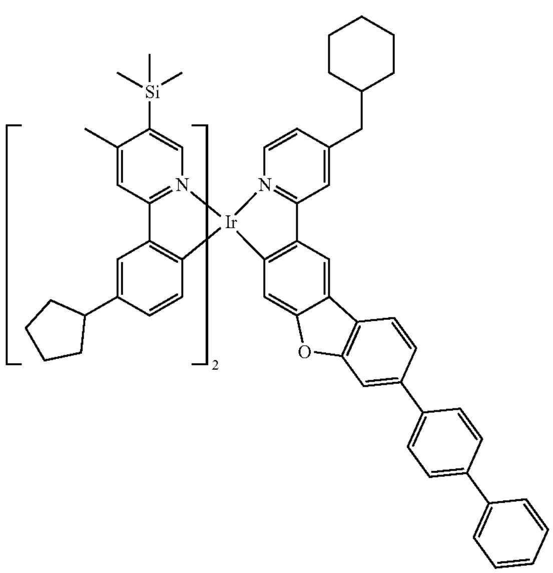
-continued
1610
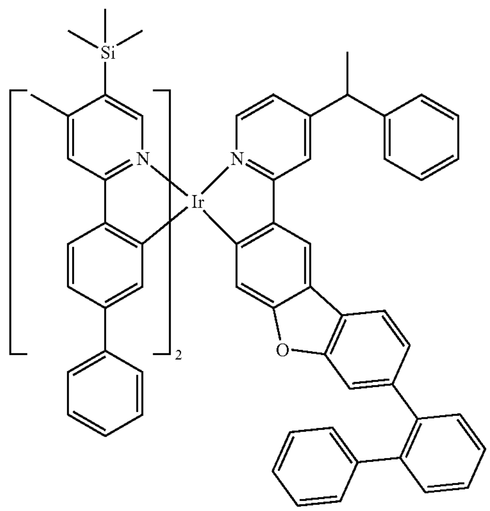
1611
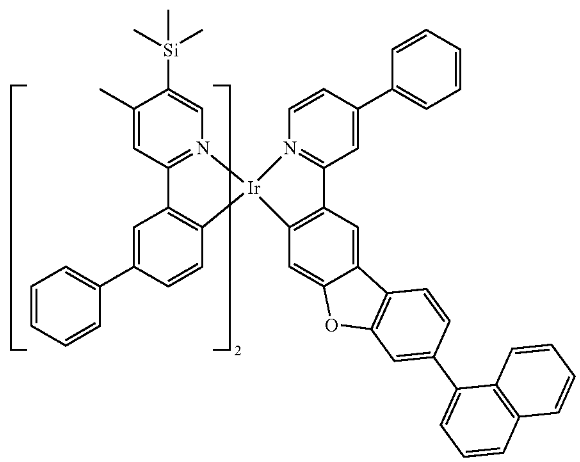
1612
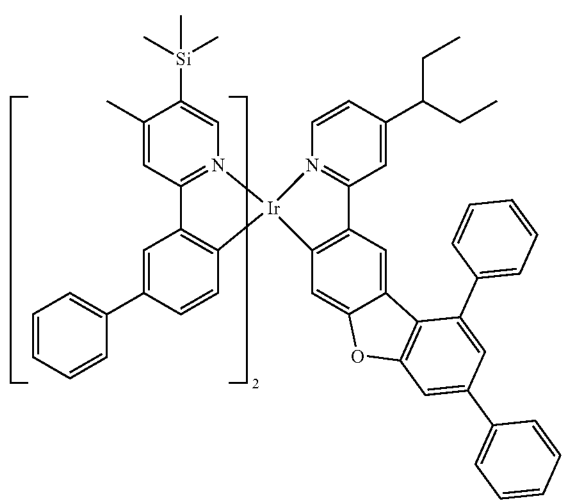

-continued
1613
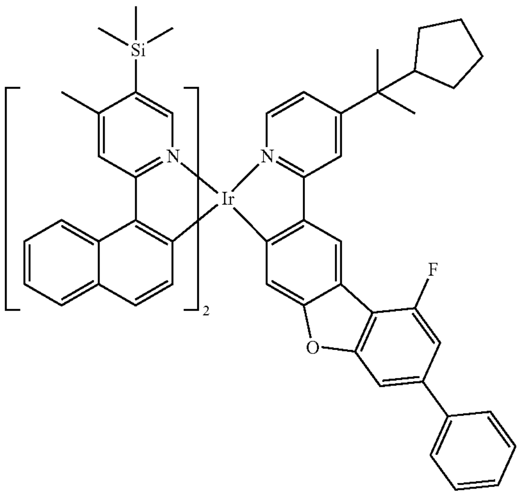
1614
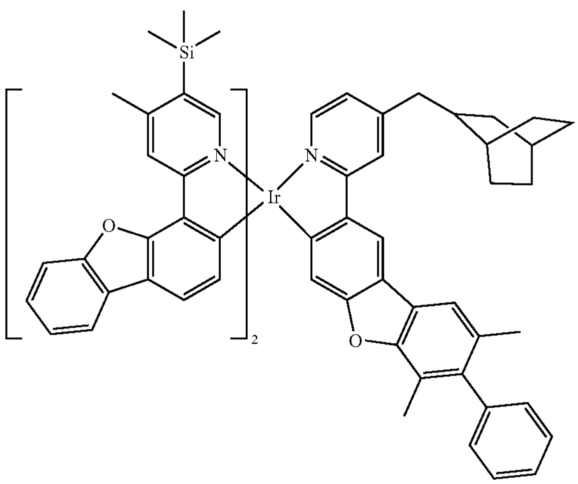
1615
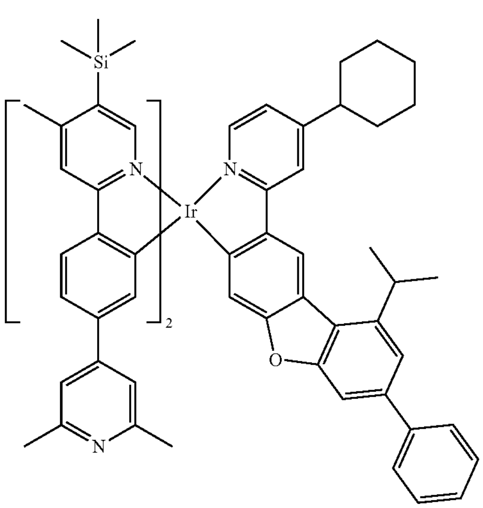
-continued
1616
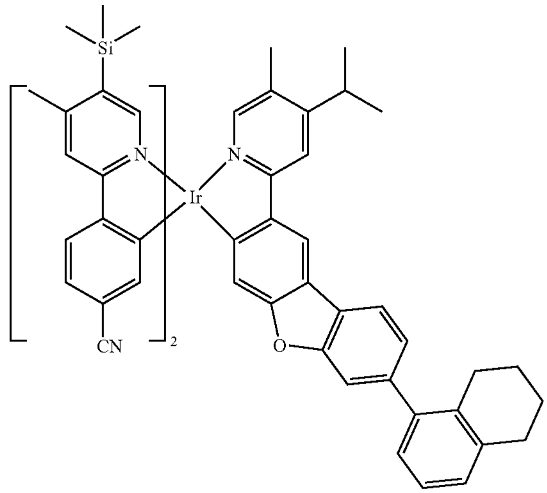
1617
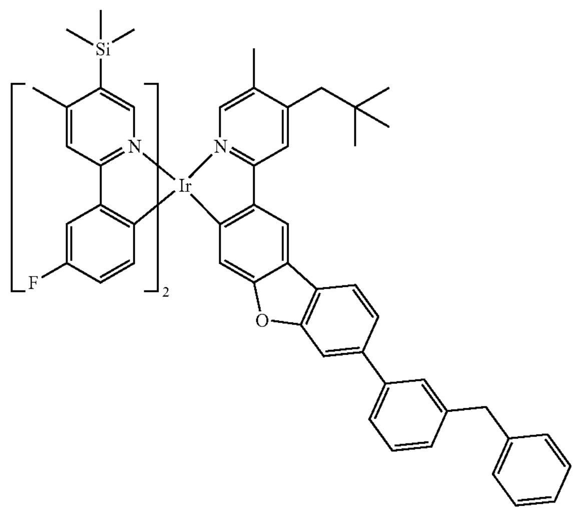
1618
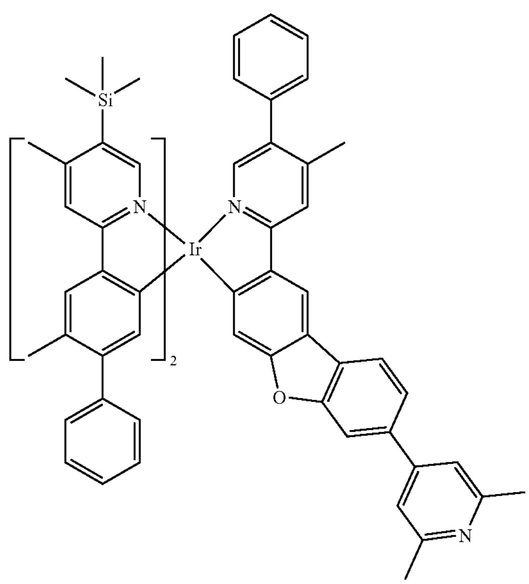

1619
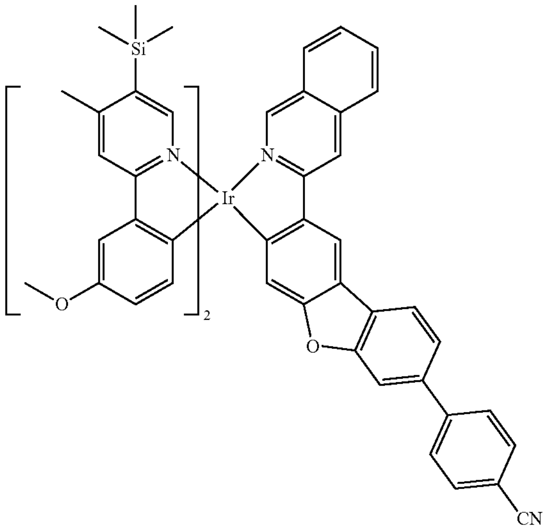
1620
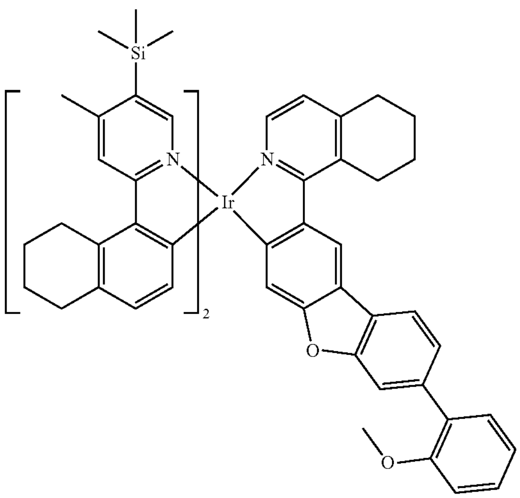
1621
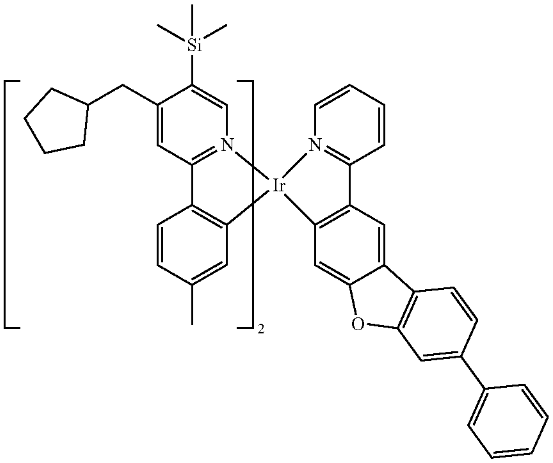
1622
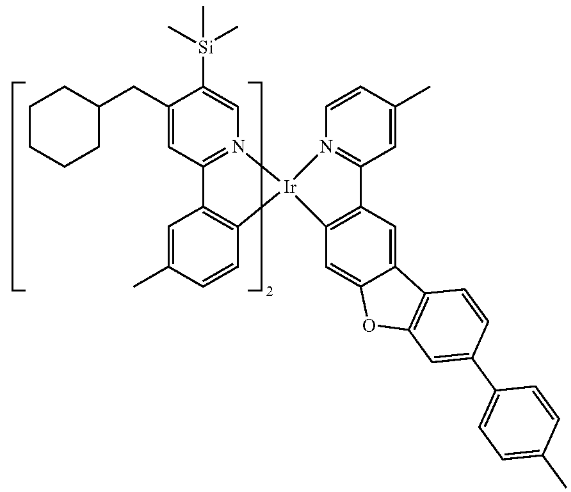
1623
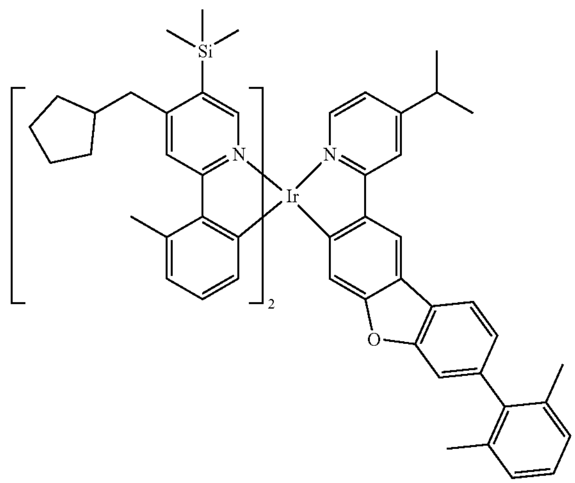
1624
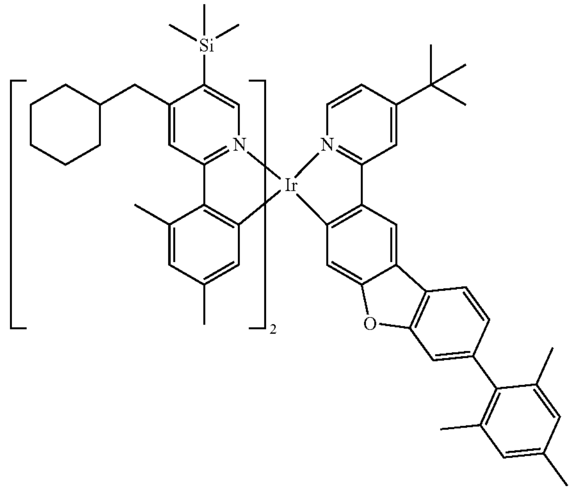

-continued
1625
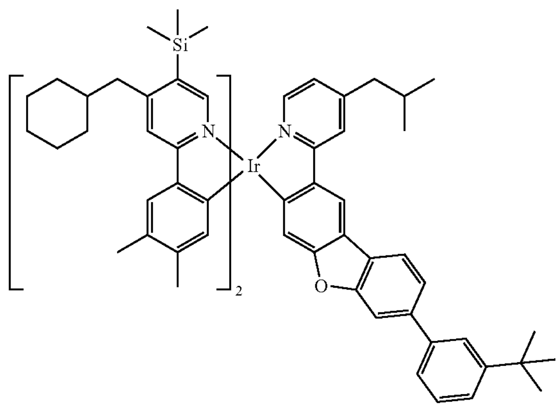
1626
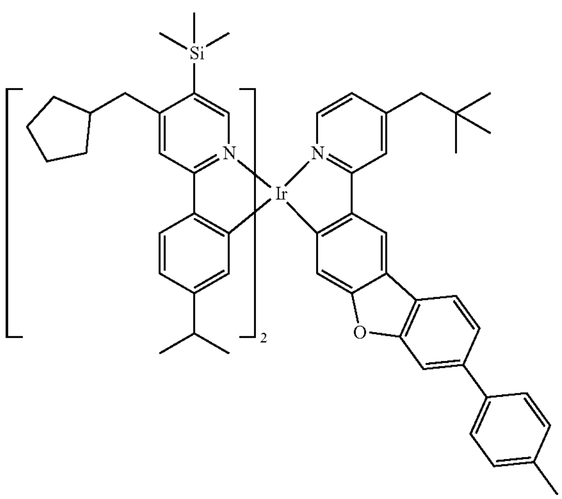
1627
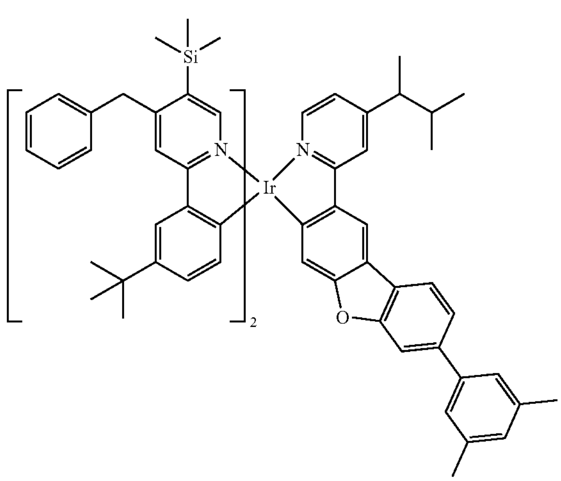
-continued
1628
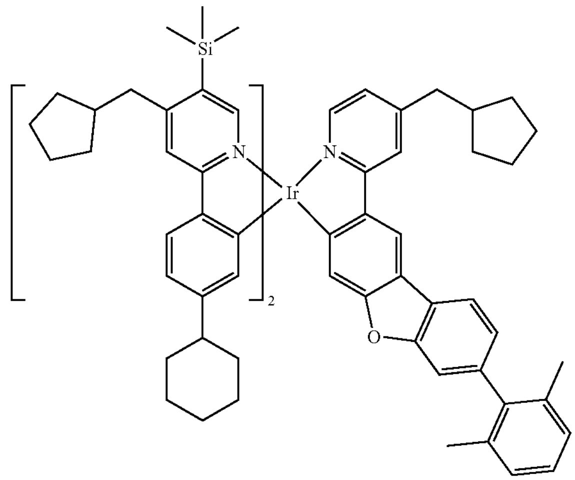
1629
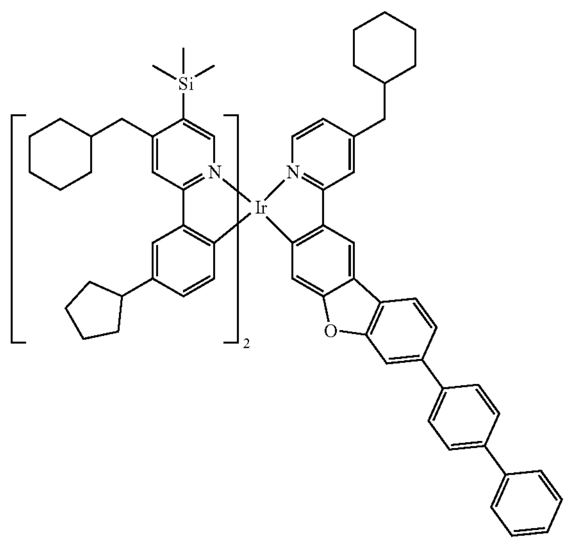
1630
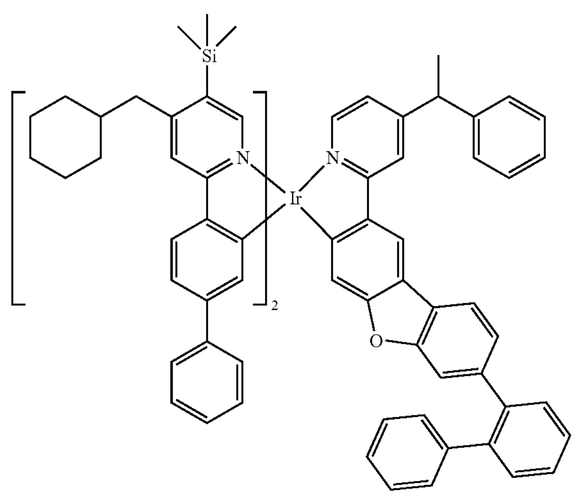

1631
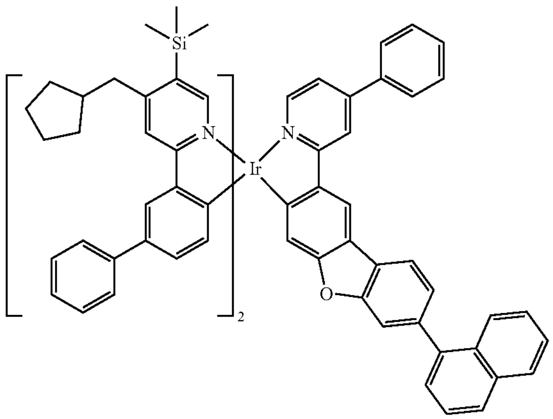
1632
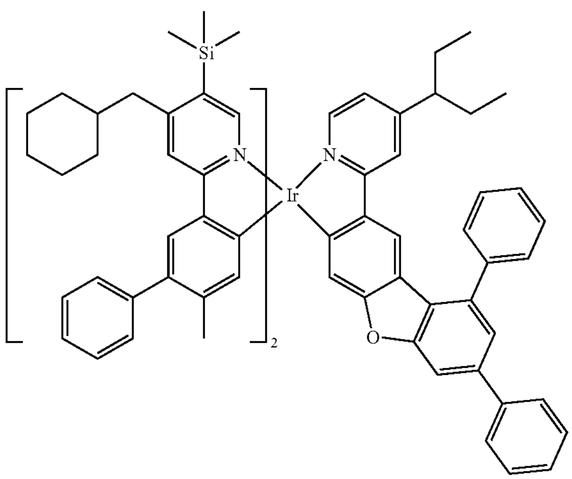
1633
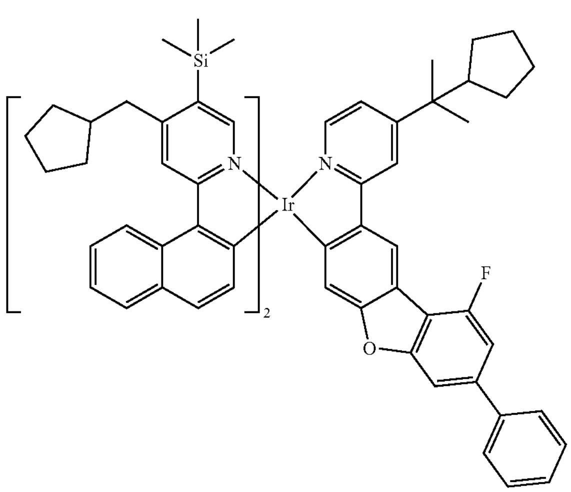
1634
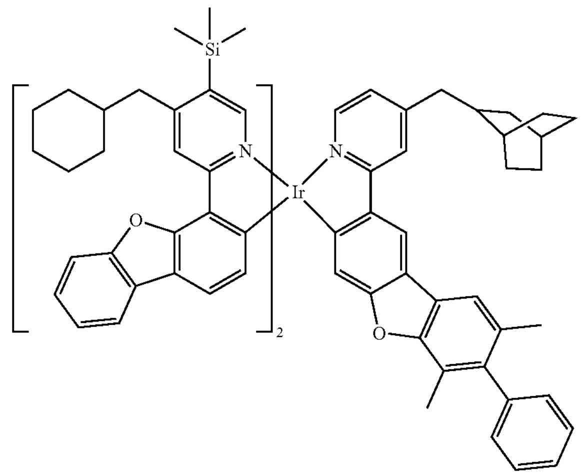
1635
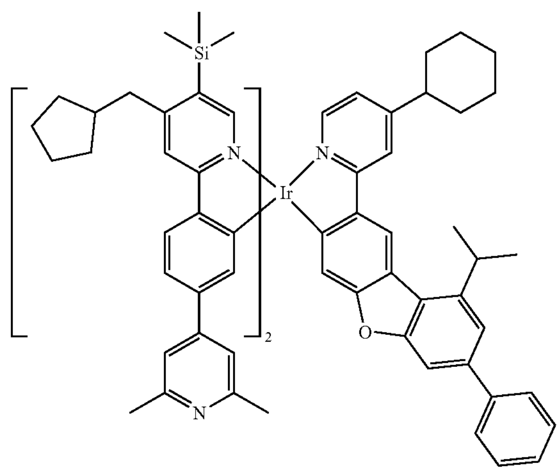
1636
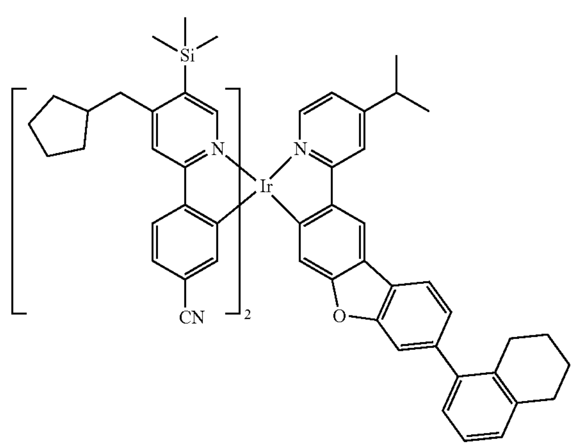

-continued
1637
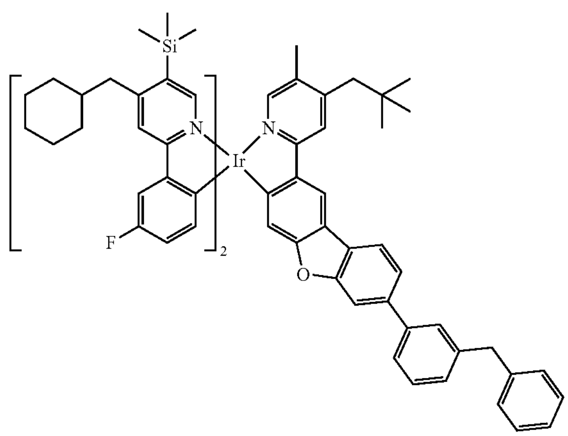
1638
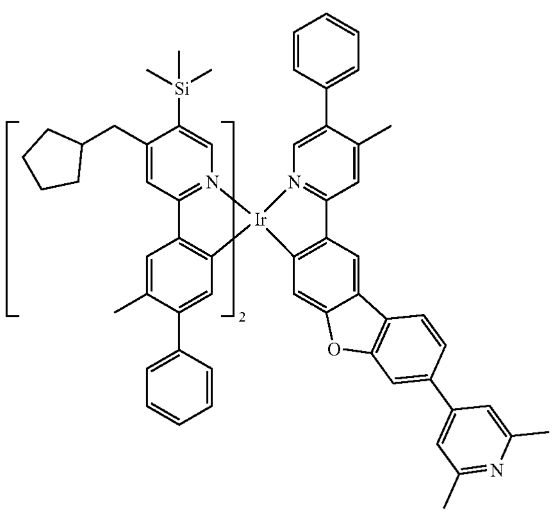
1639
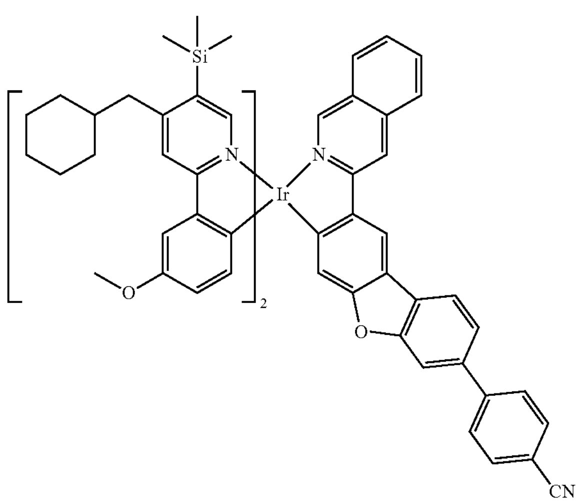
-continued
1640
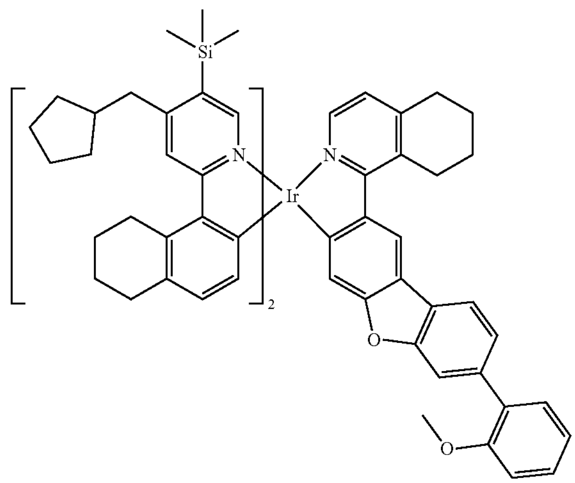
1641
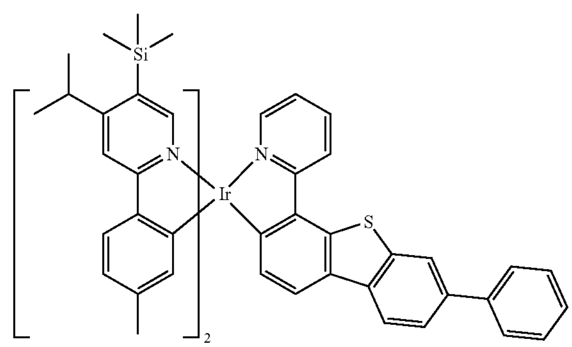
1642
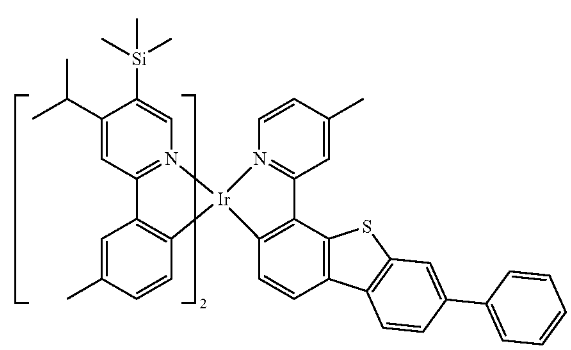
1643
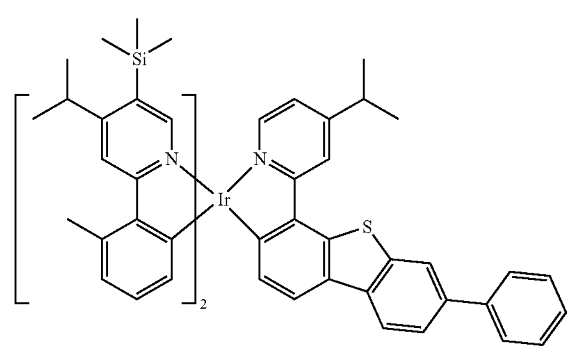

-continued
1644
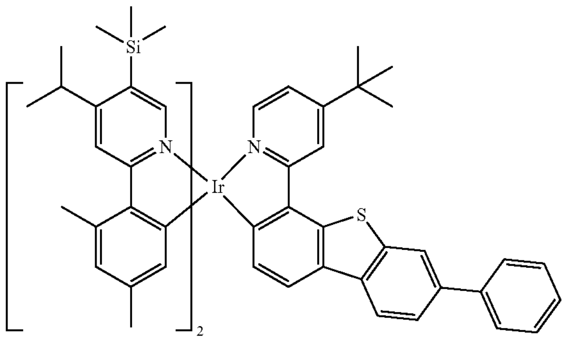
1645
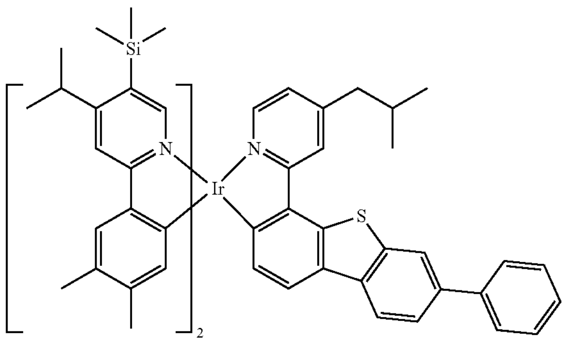
1646
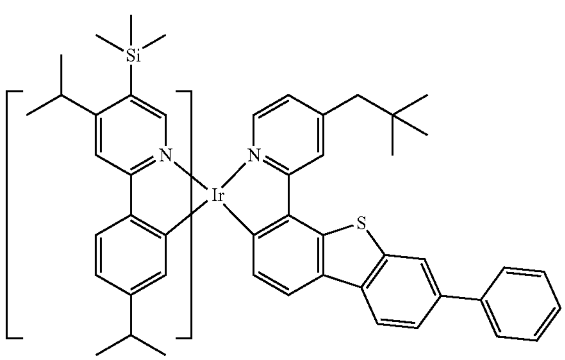
1647
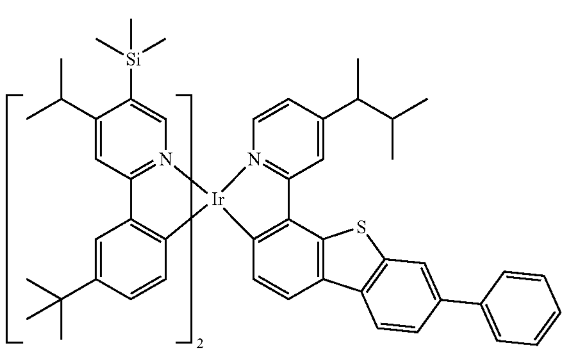
-continued
1648
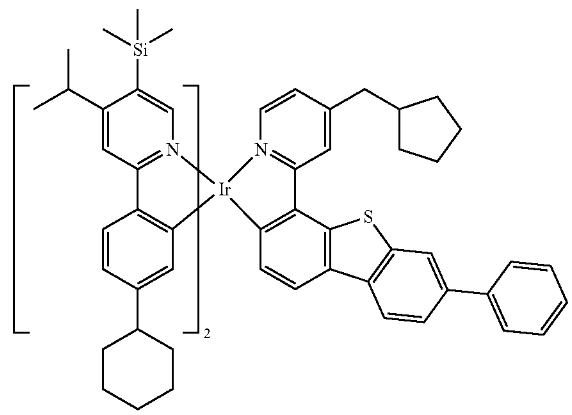
1649
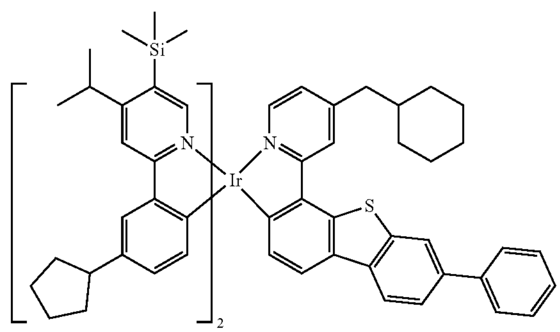
1650
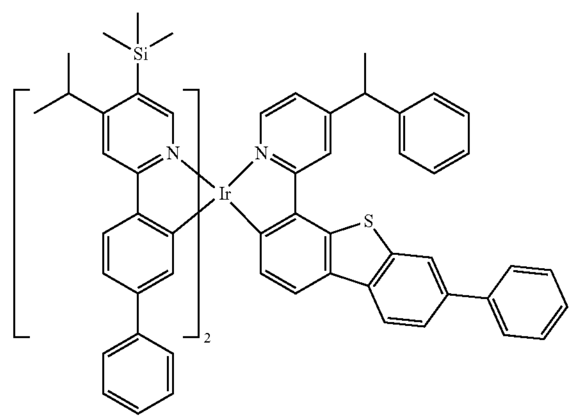
1651
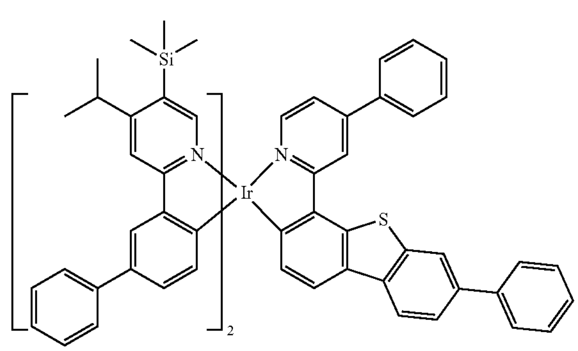

1652
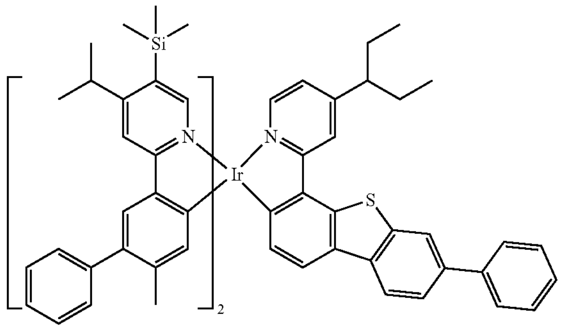
1653
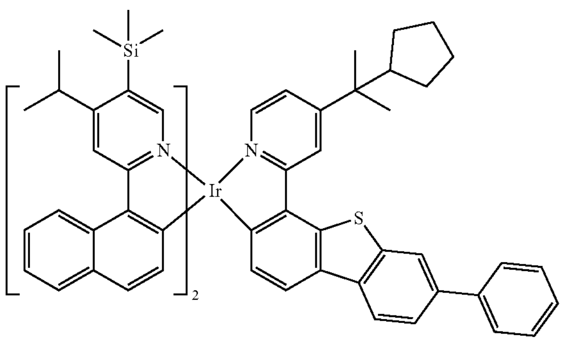
1654
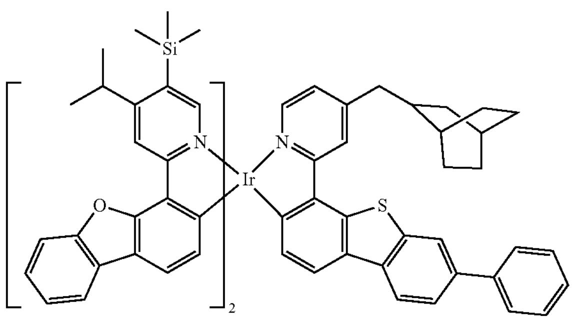
1655
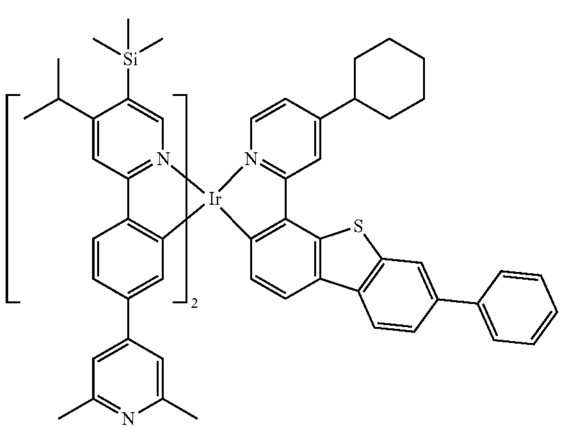
1656
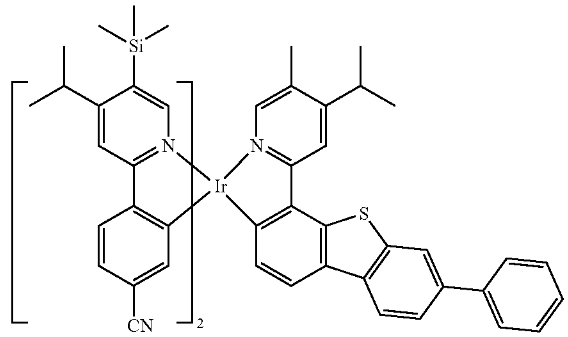
1657
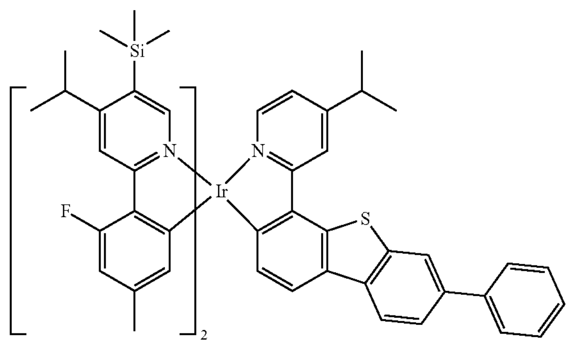
1658
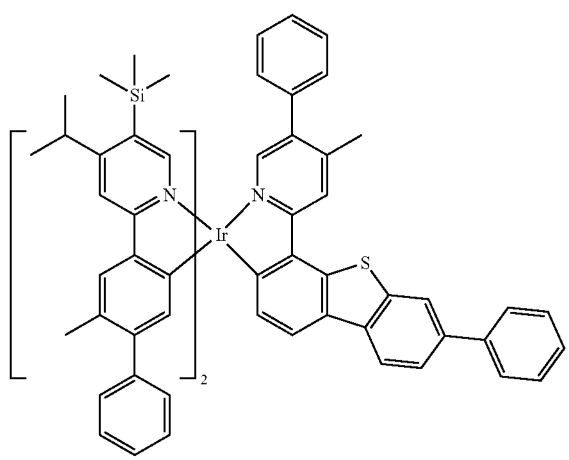
1659
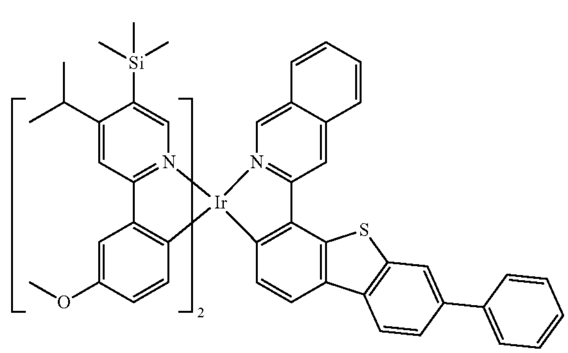

-continued
1660
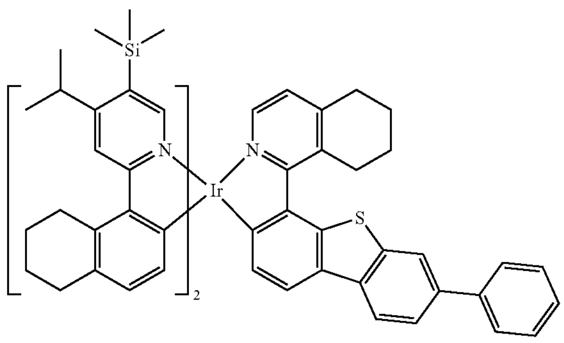
1661
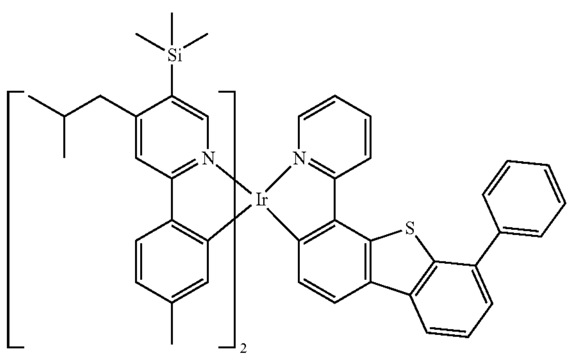
1662
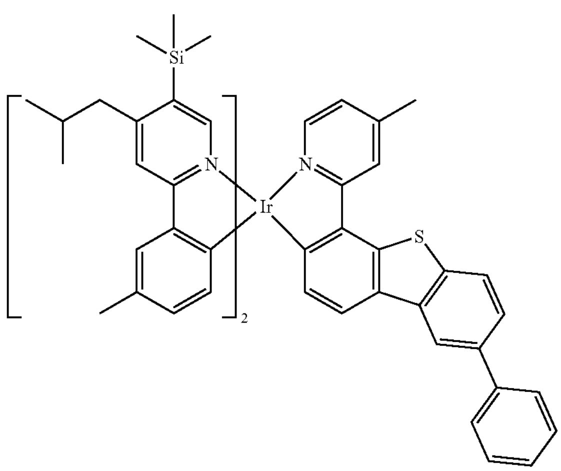
1663
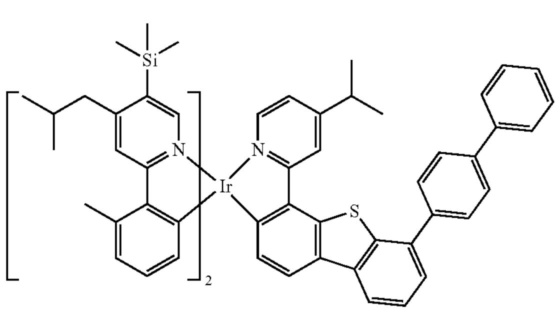
-continued
1664
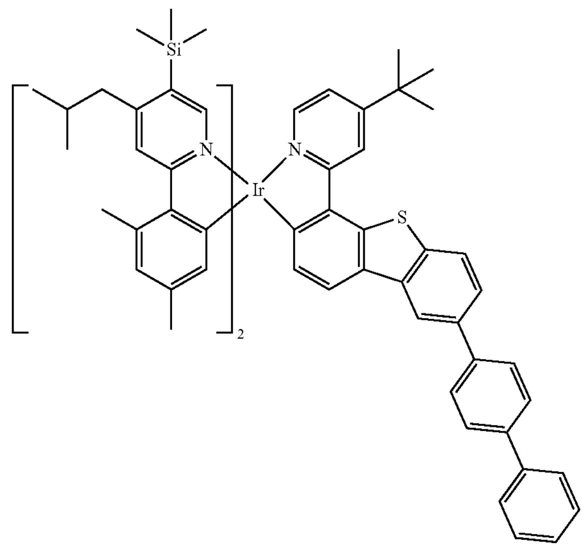
1665
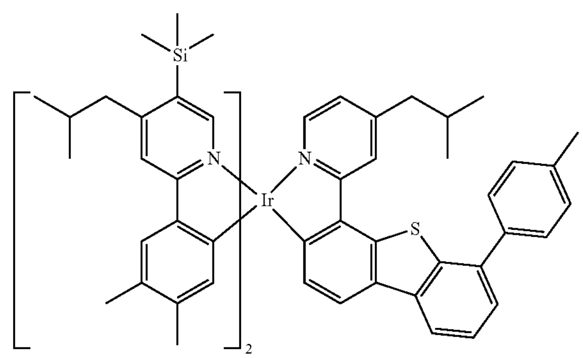
1666
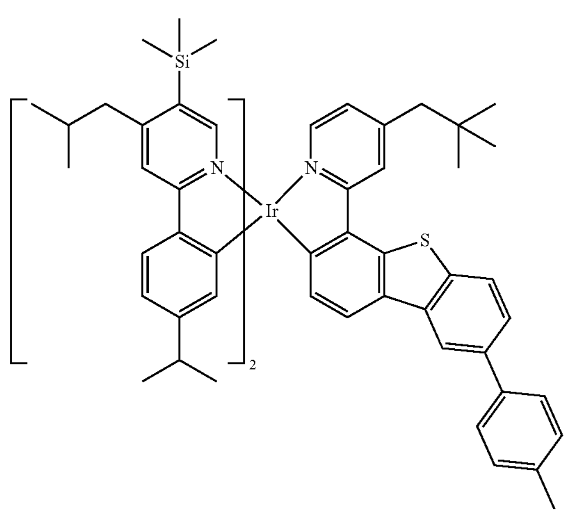

-continued
1667
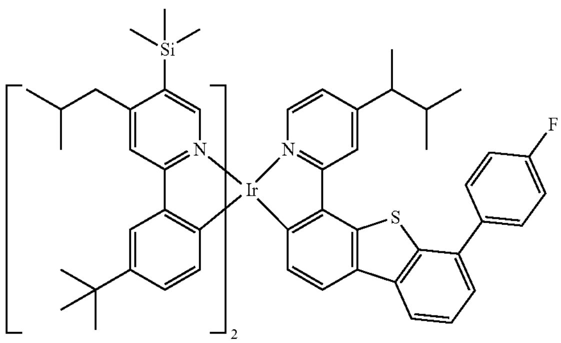
1668
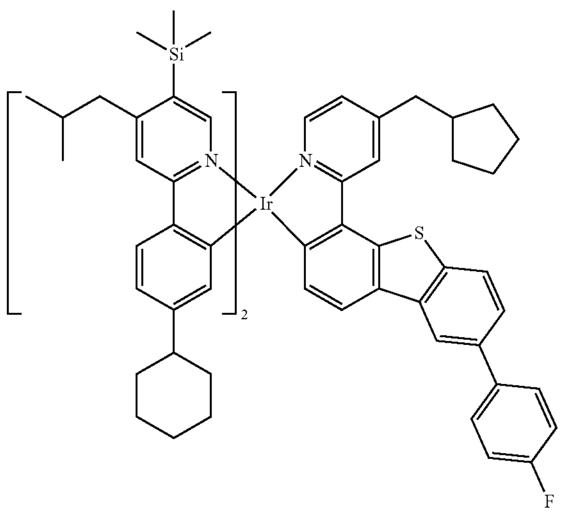
1669
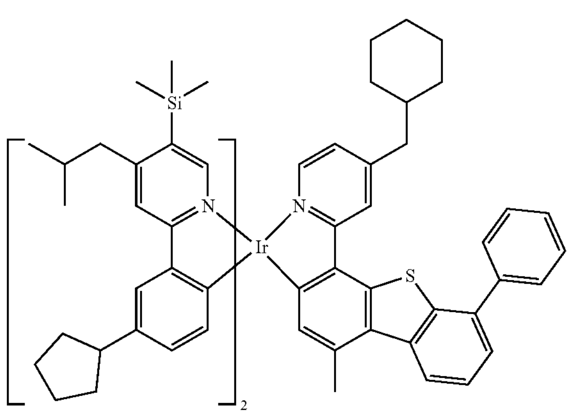
-continued
1670
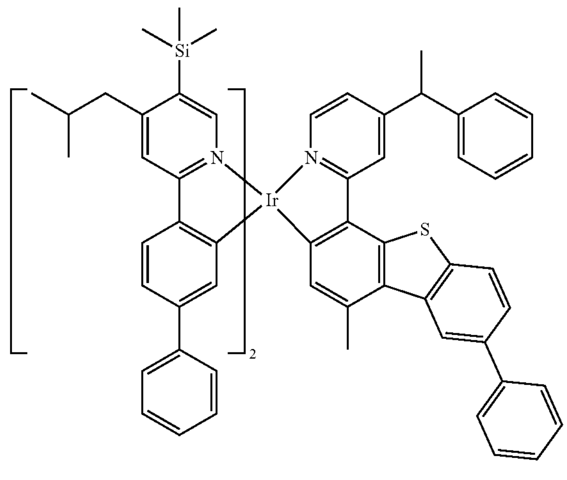
1671
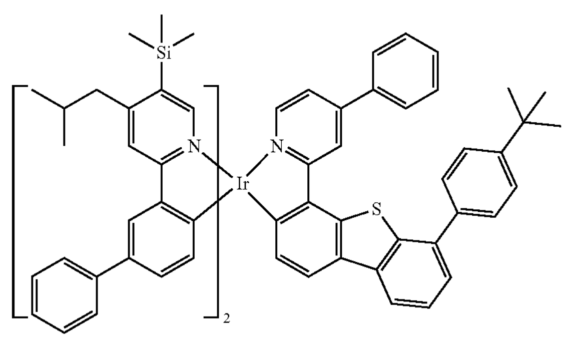
1672
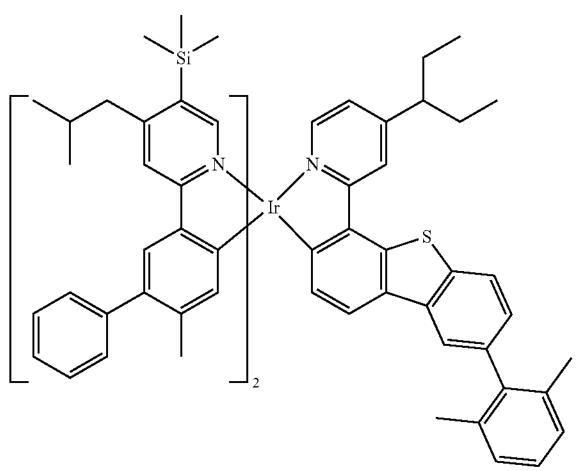

-continued
1673
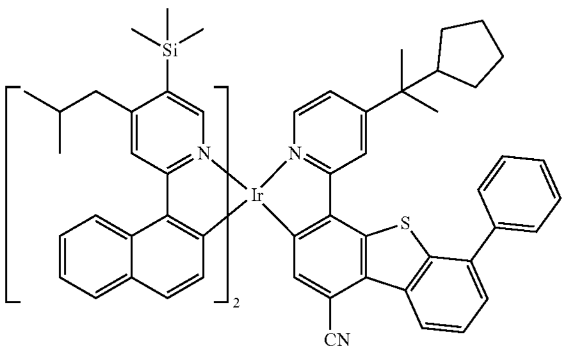
1674
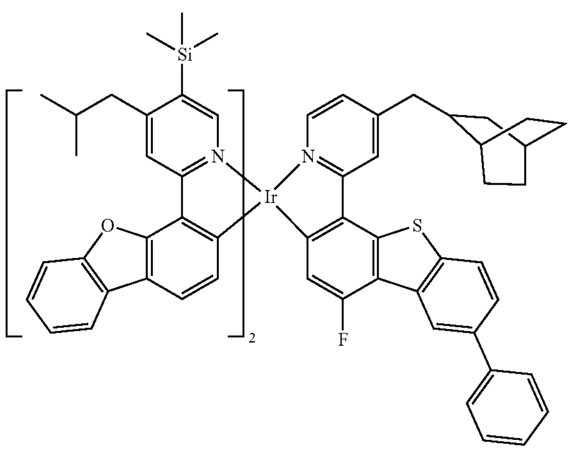
1675
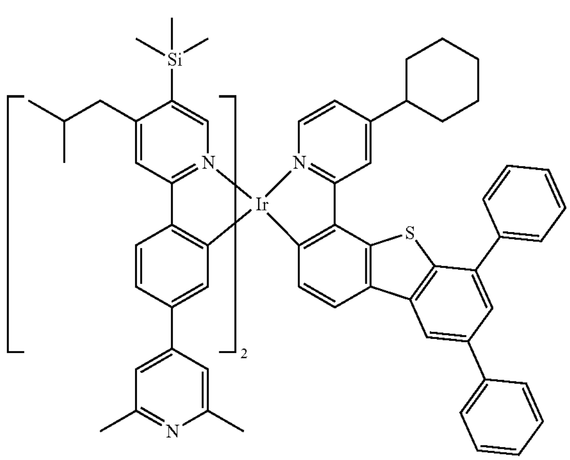
-continued
1676
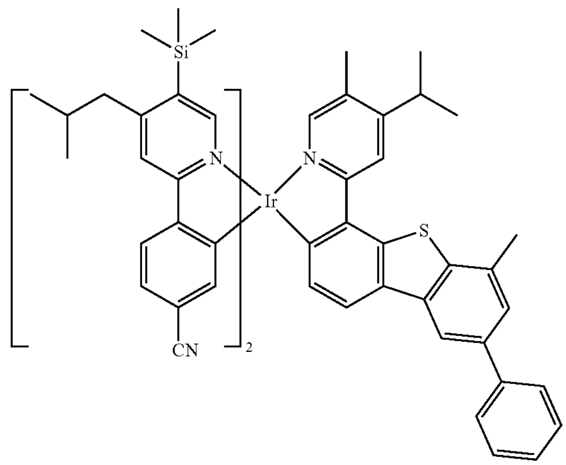
1677
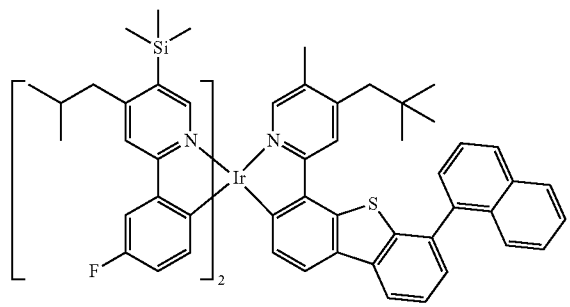
1678
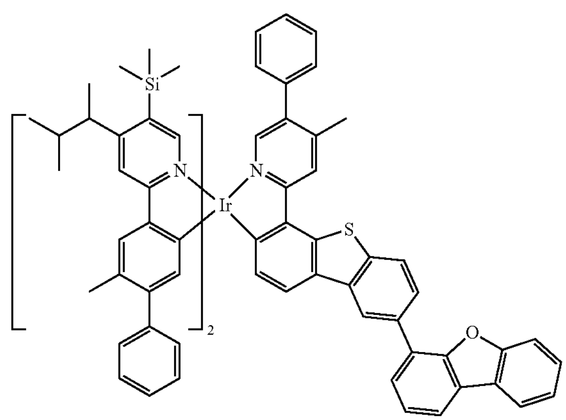
1679
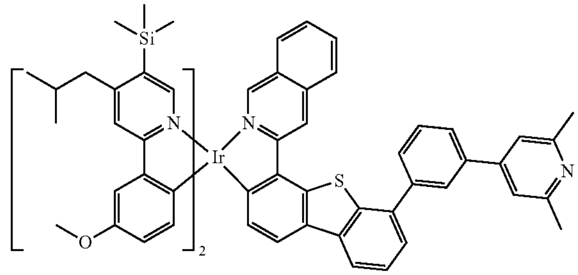

-continued
1680
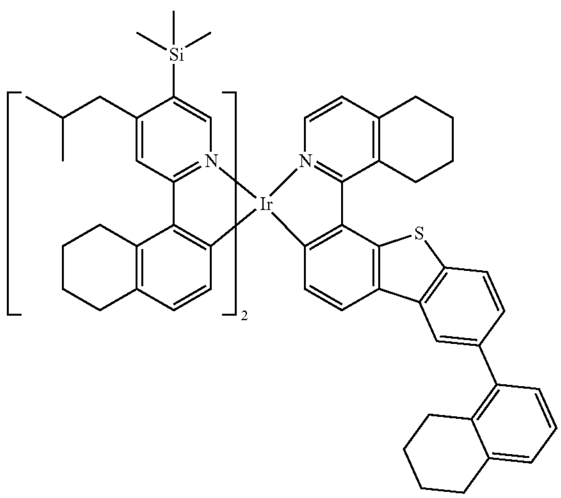
1681
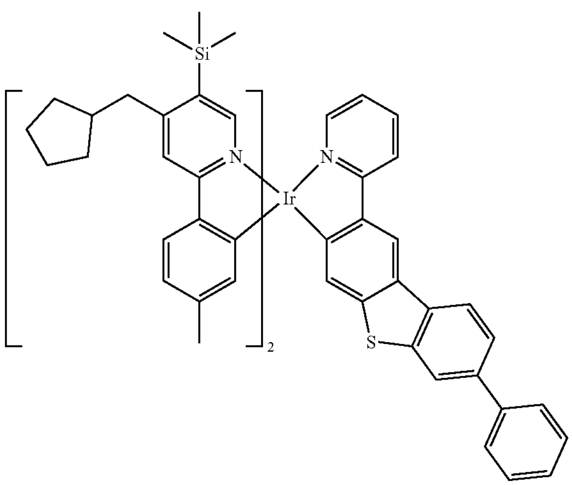
1682
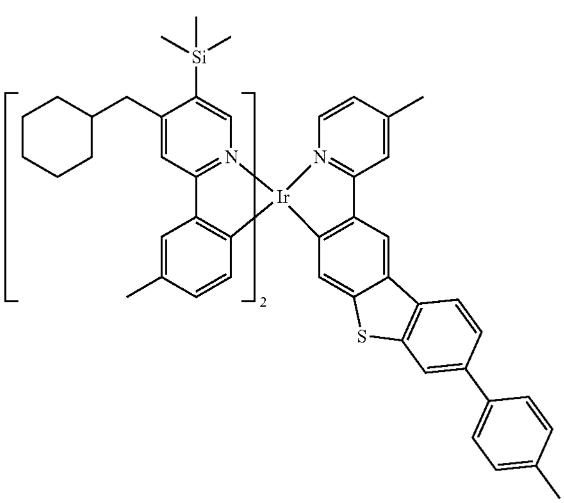
-continued
1683
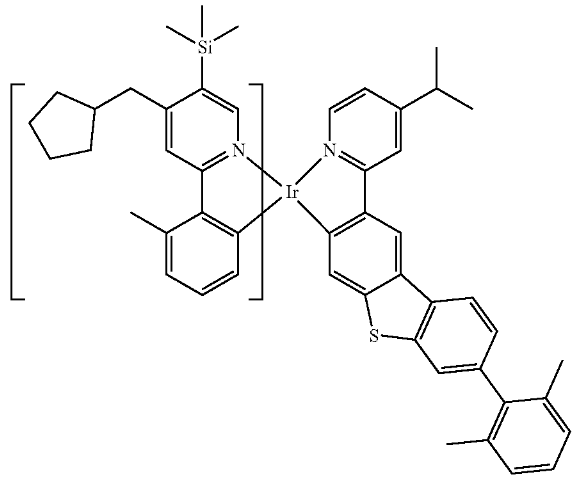
1684
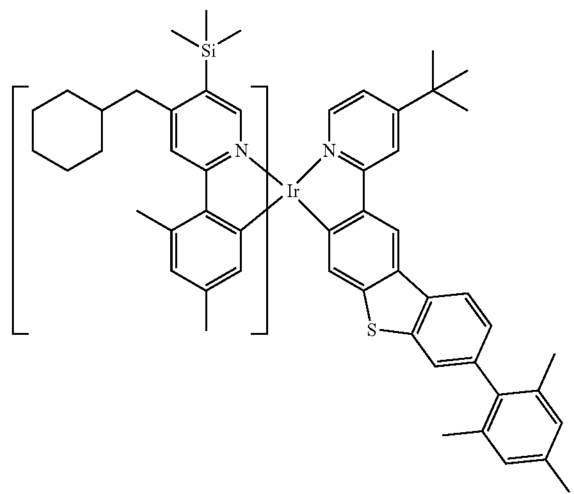
1685
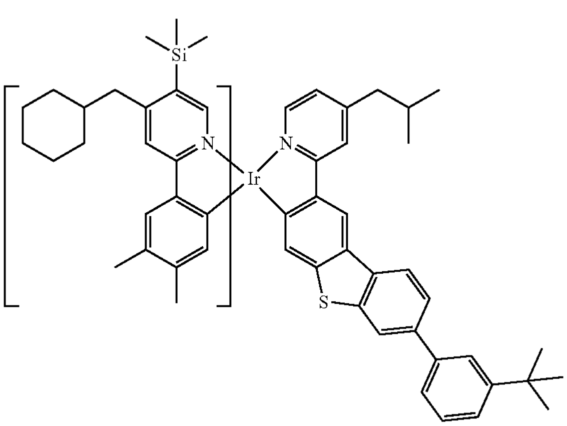

1686
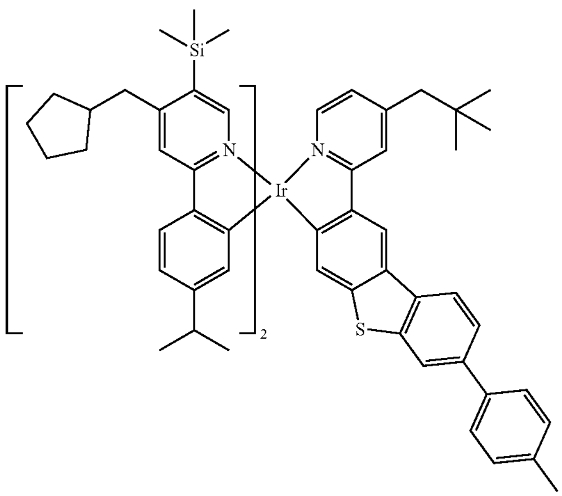
1687
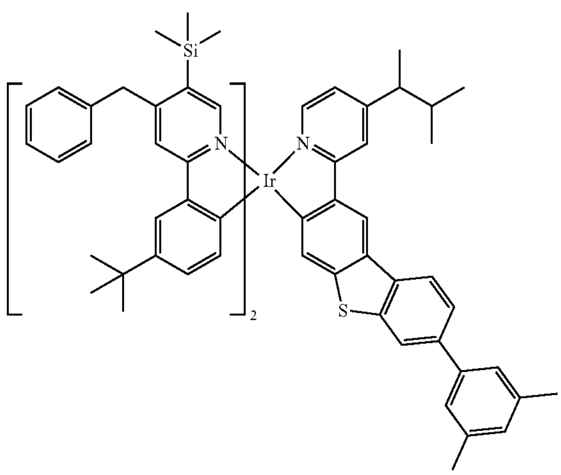
1688
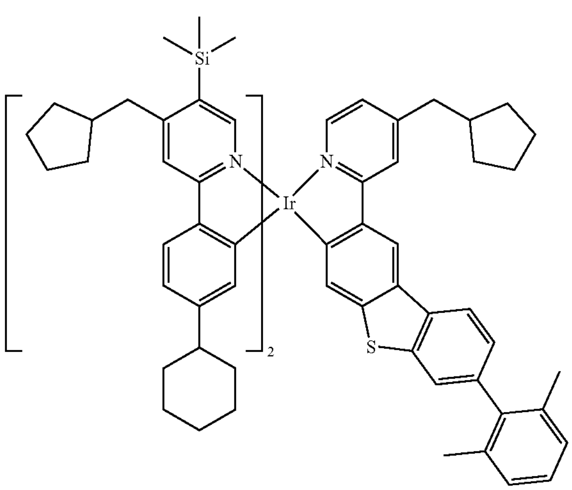
1689
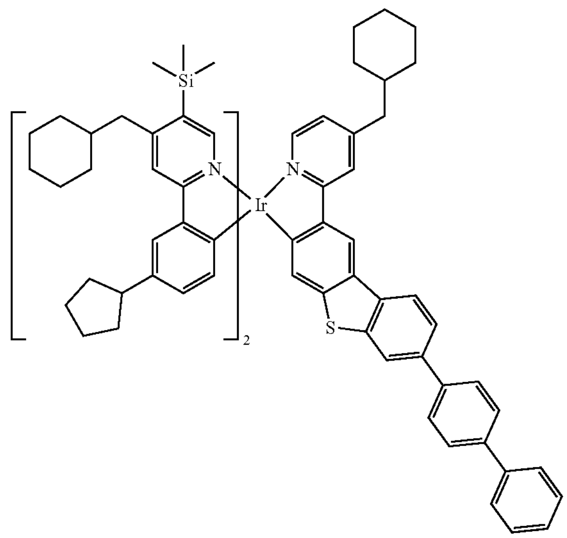
1690
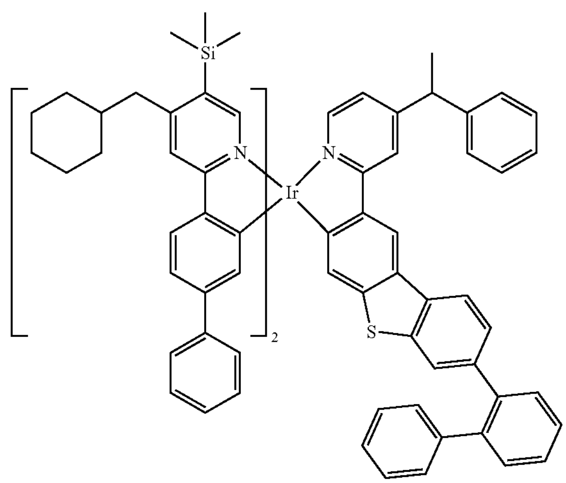
1691
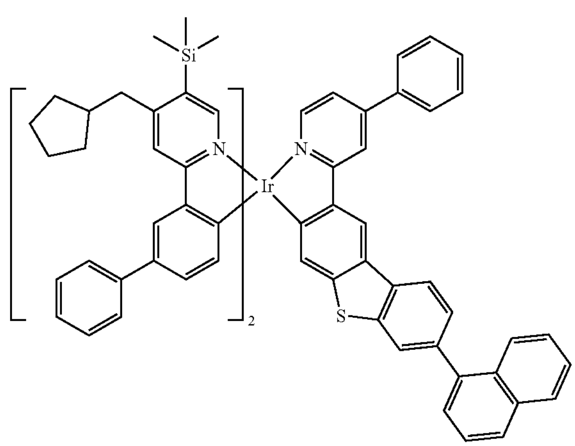

1692
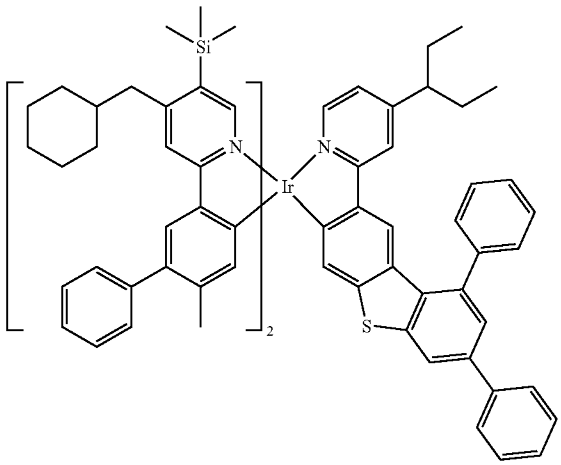
1693
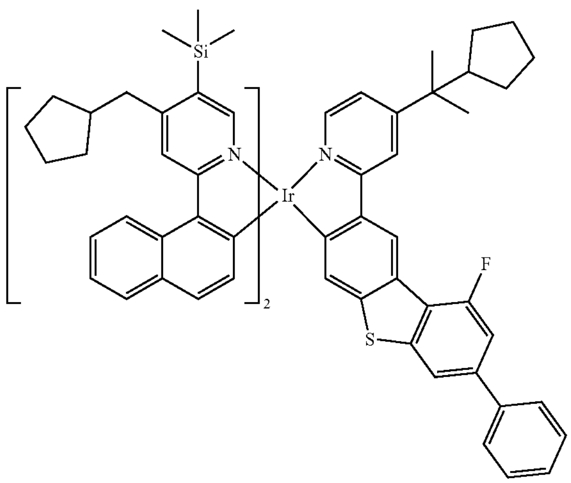
1694
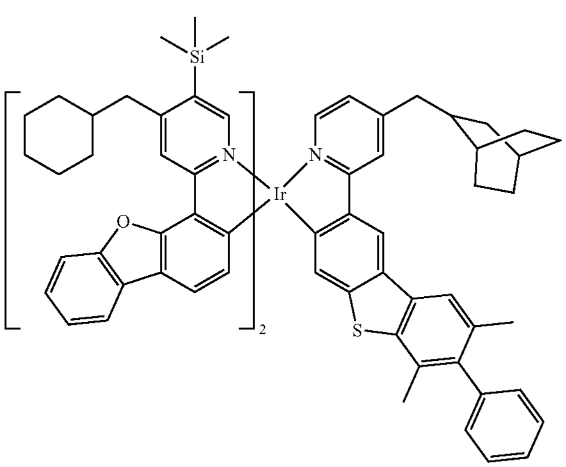
1695
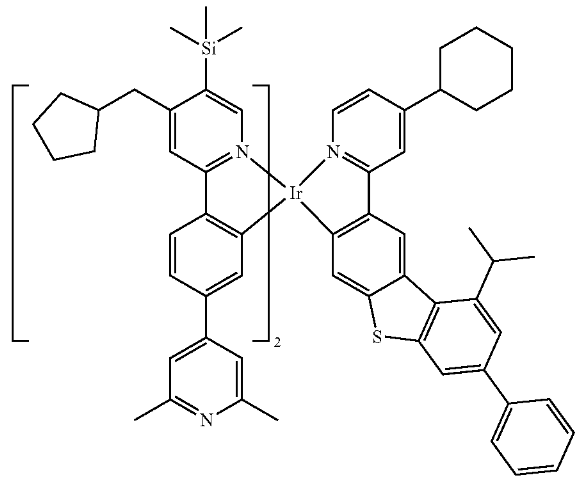
1696
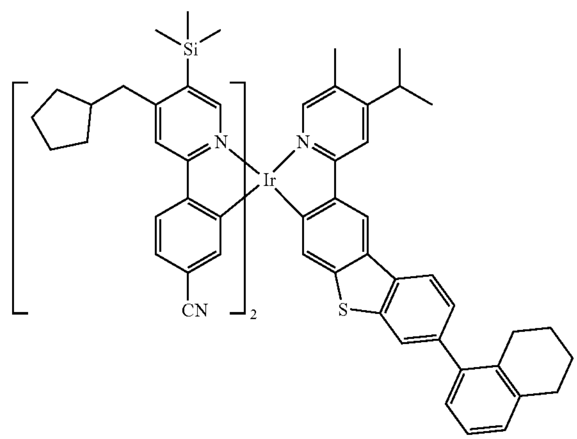
1697
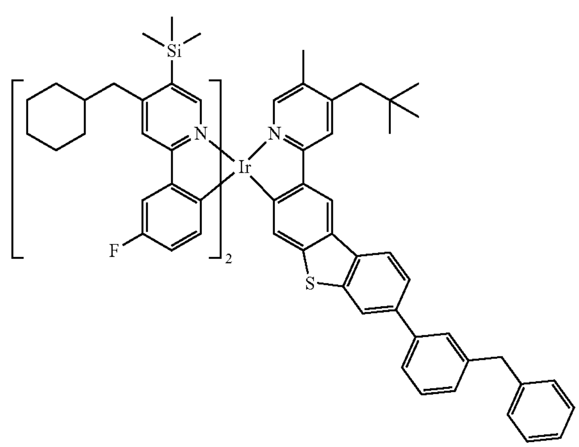

-continued
1698
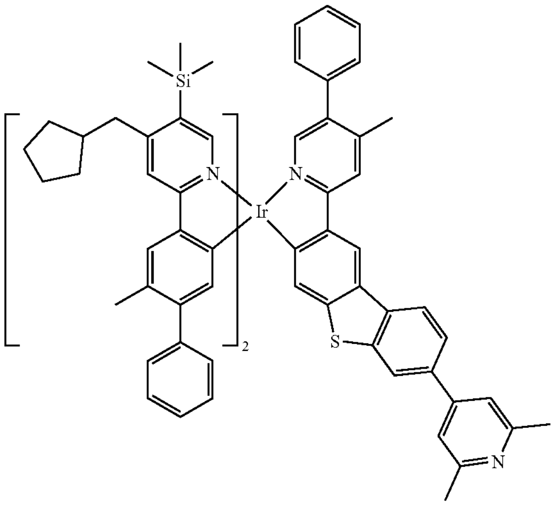
1699
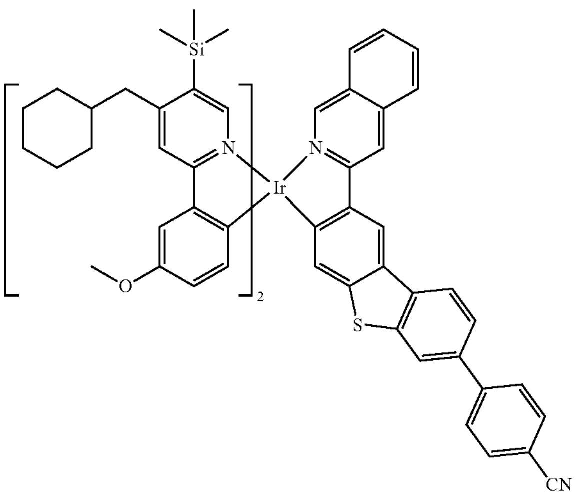
1700
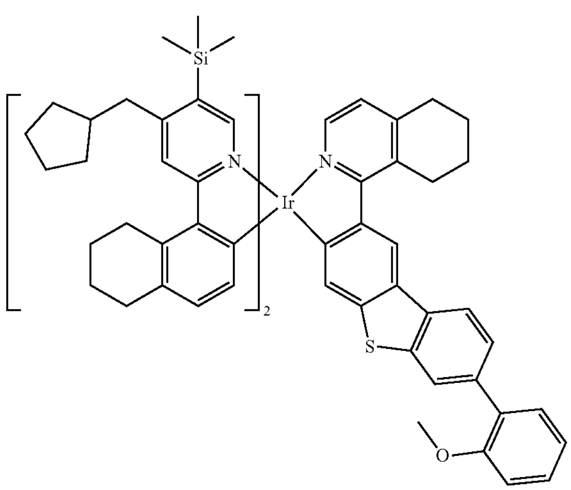
-continued
1701
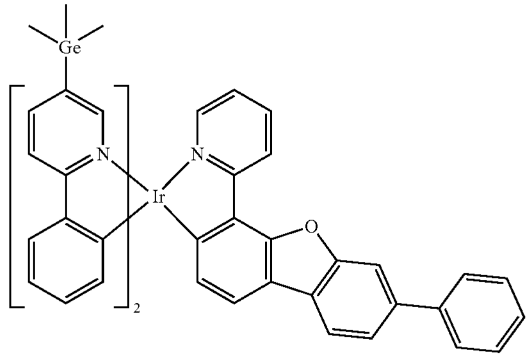
1702
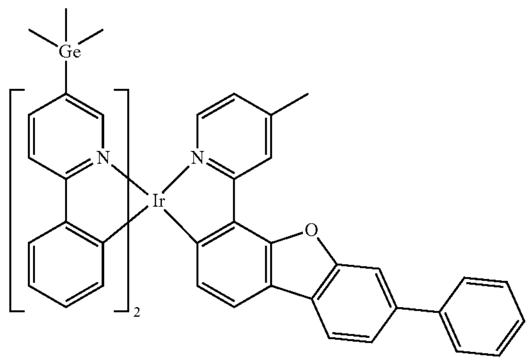
1703
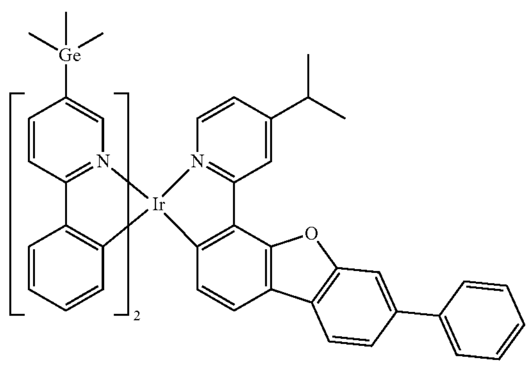
1704
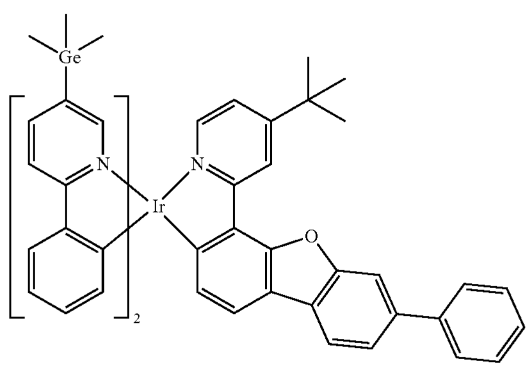

-continued
1705
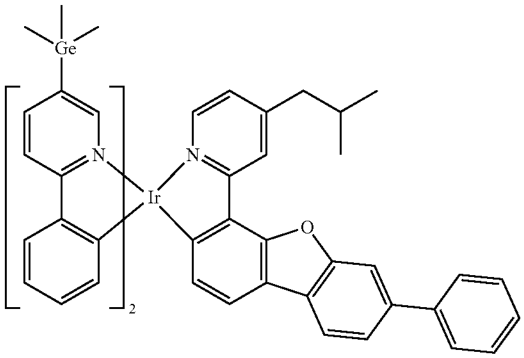
1706
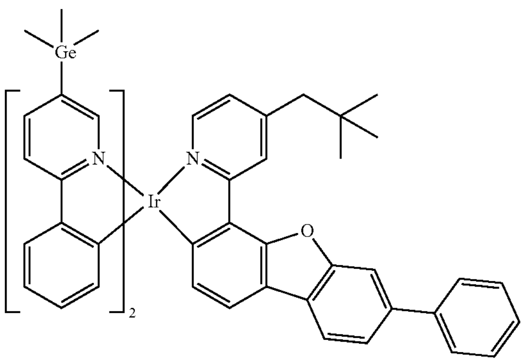
1707
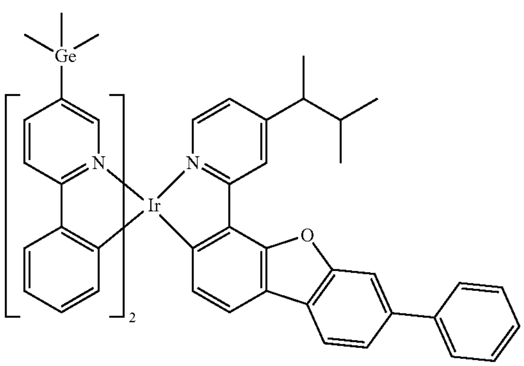
1708
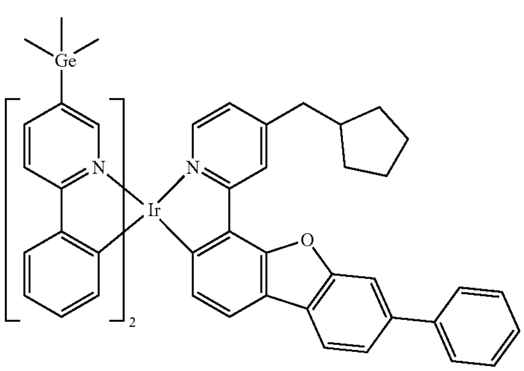
-continued
1709
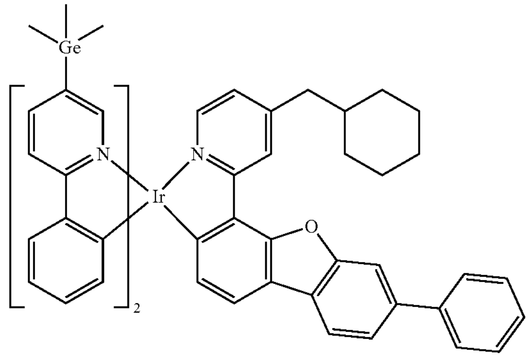
1710
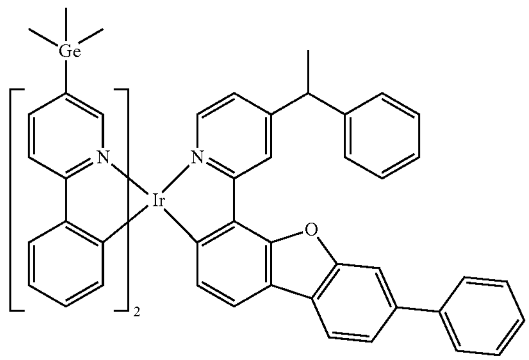
1711
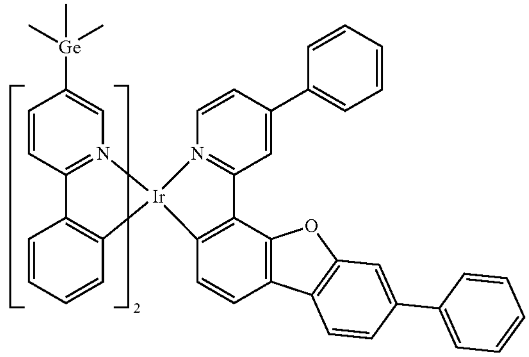
1712
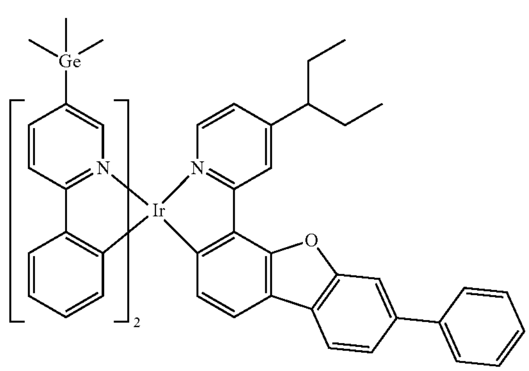

-continued
1713
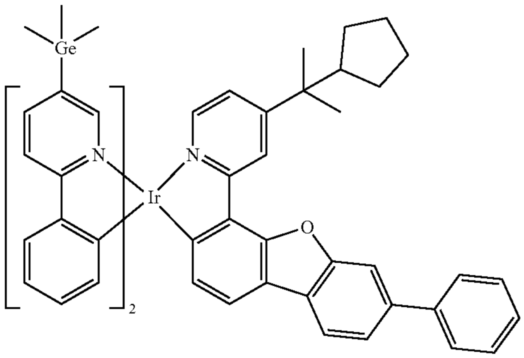
1714
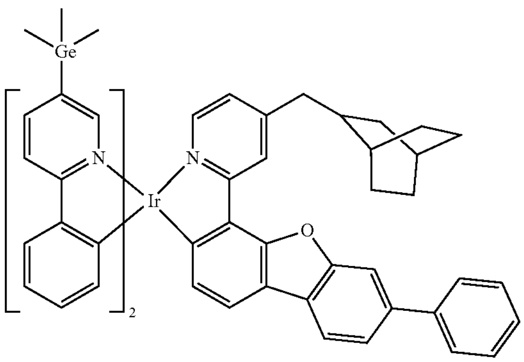
1715
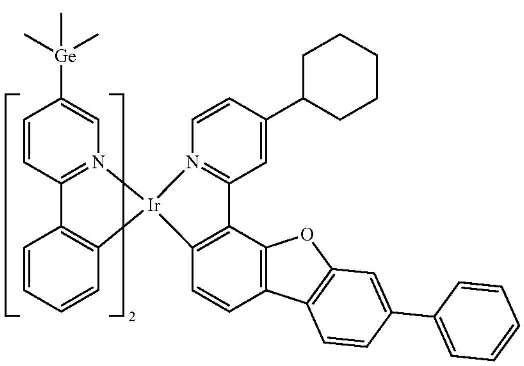
1716
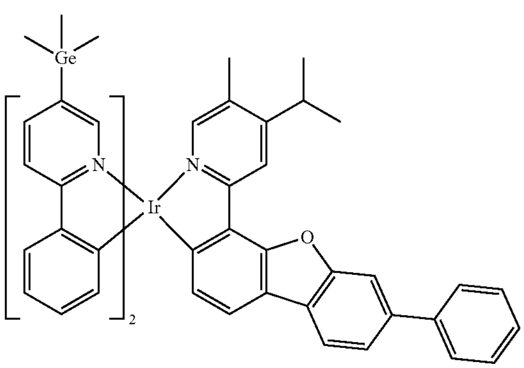
-continued
1717
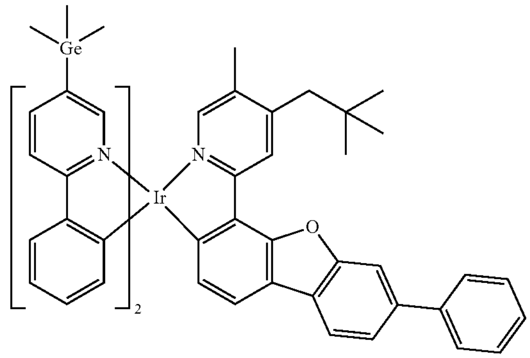
1718
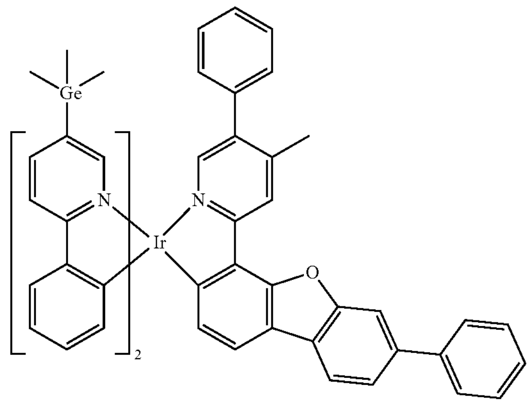
1719
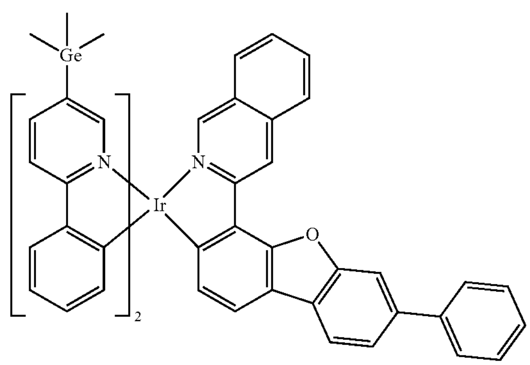
1720
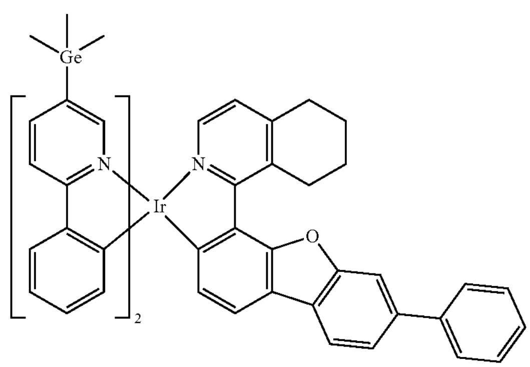

1721
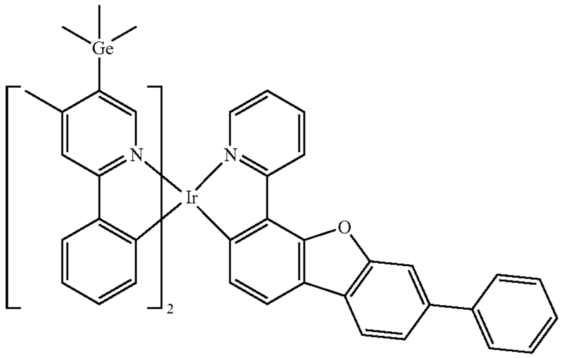
1722
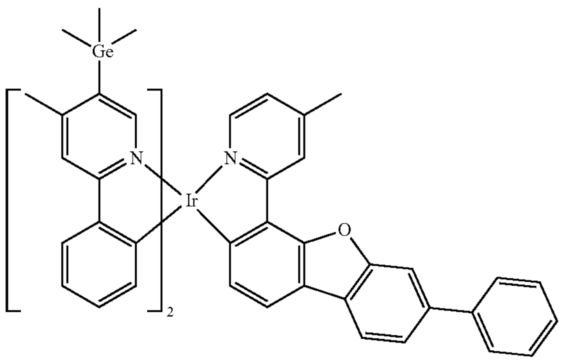
1723
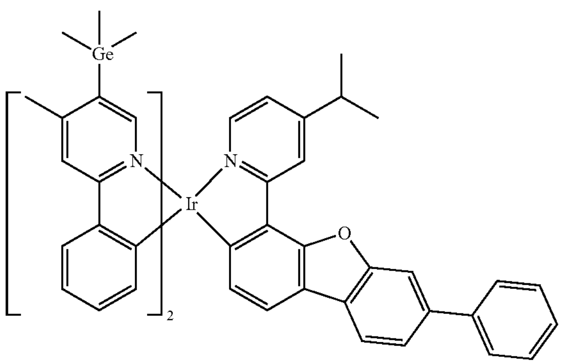
1724
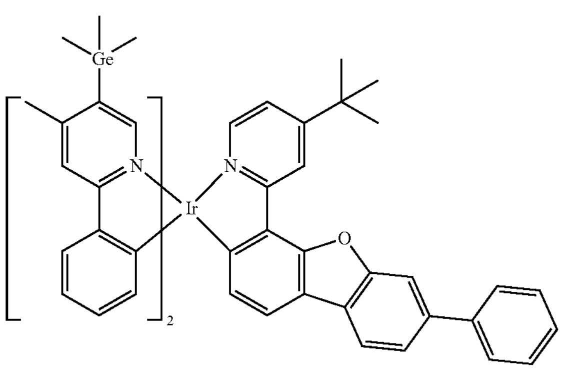
1725
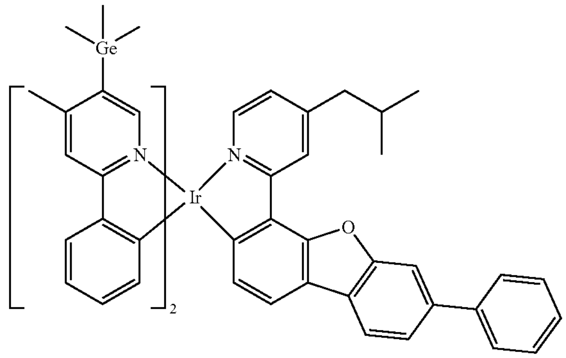
1726
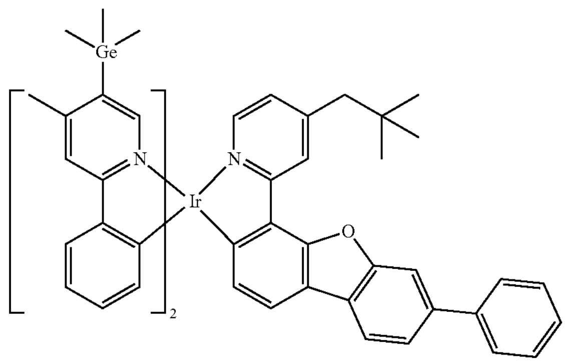
1727
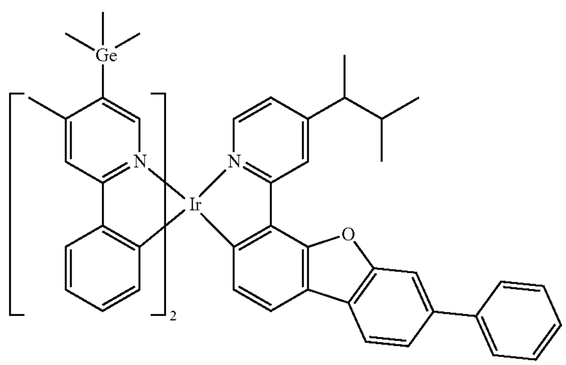
1728
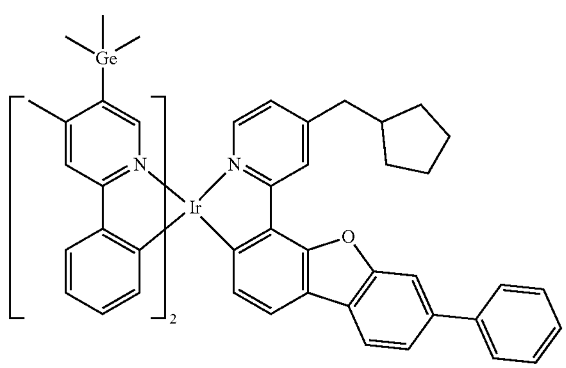

-continued
1729
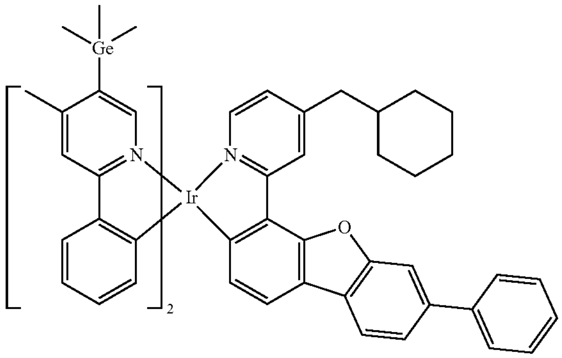
1730
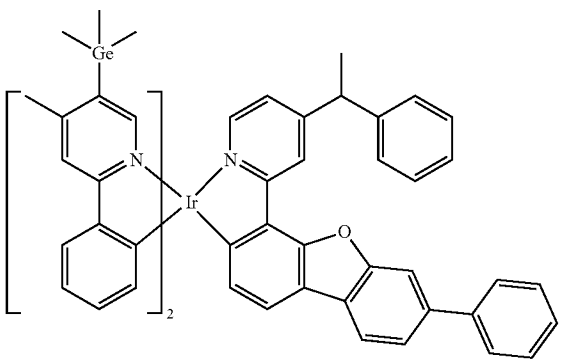
1731
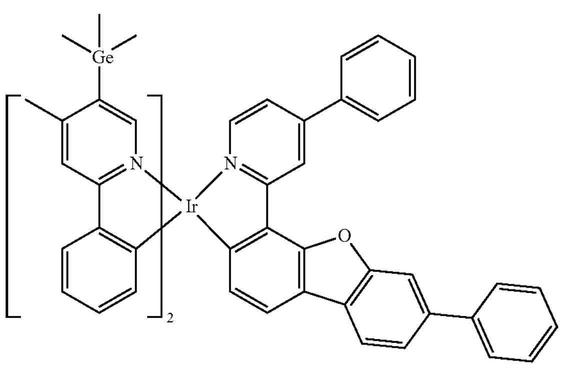
1732
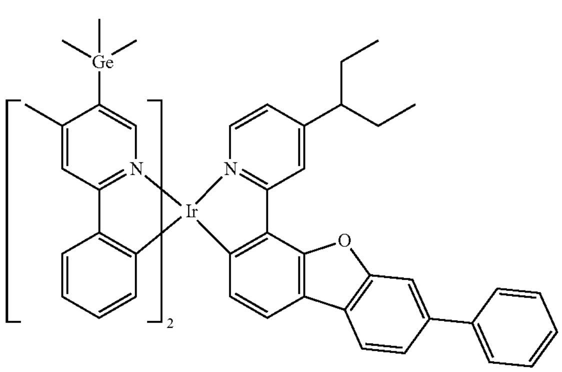
-continued
1733
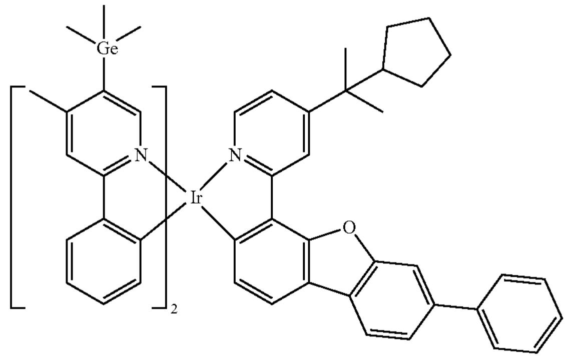
1734
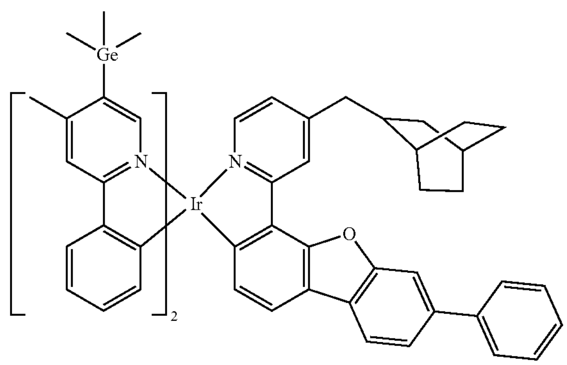
1735
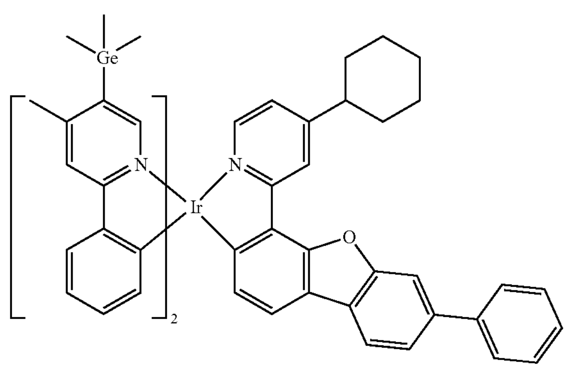
1736
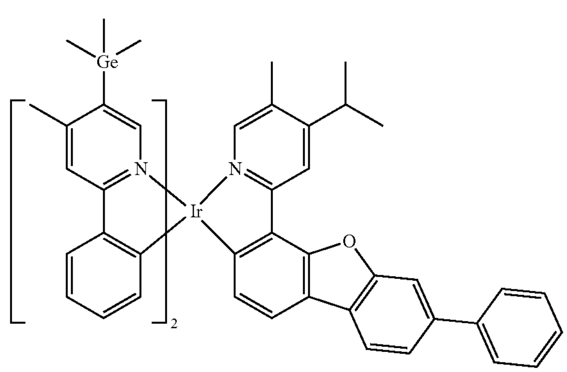

-continued
1737
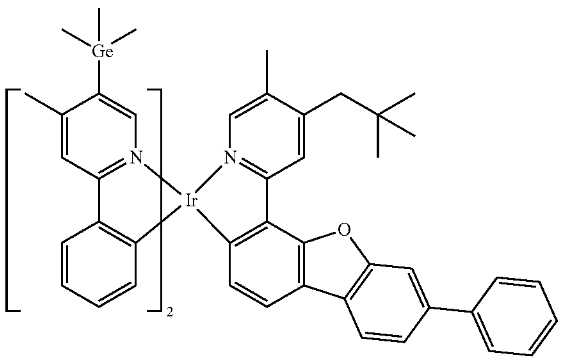
1738
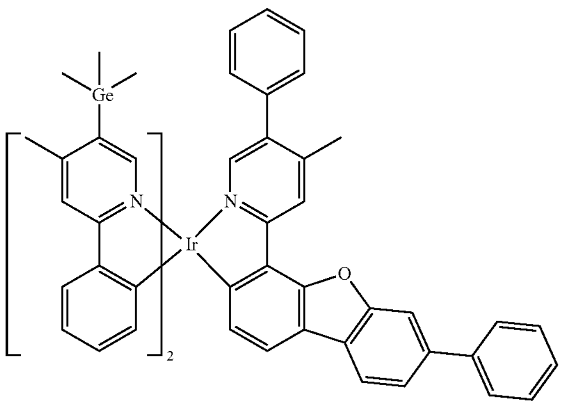
1739
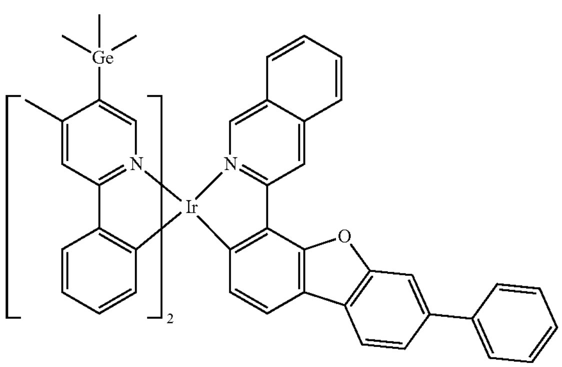
1740
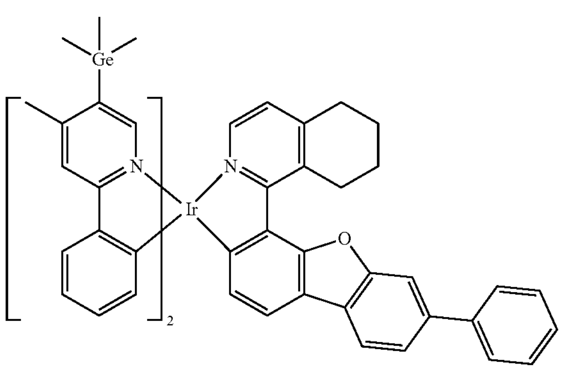
-continued
1741
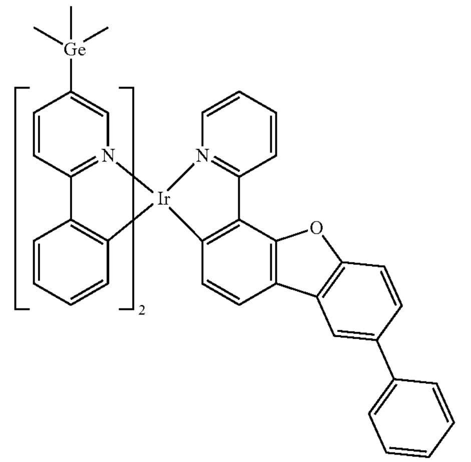
1742
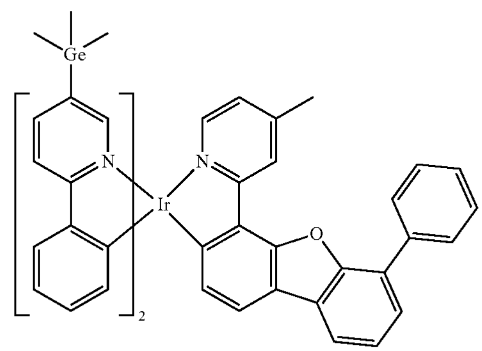
1743
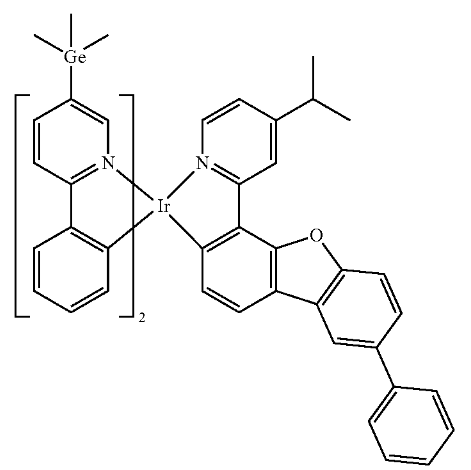
1744
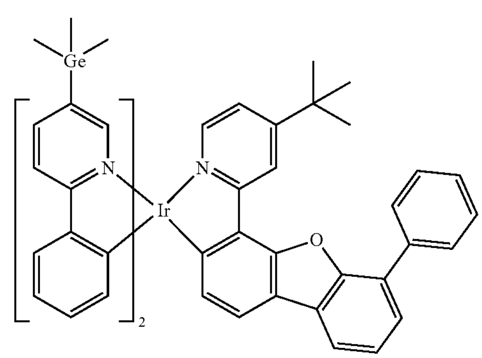

-continued
1745
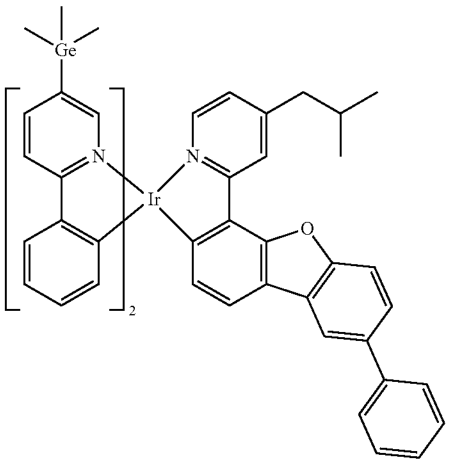
1746
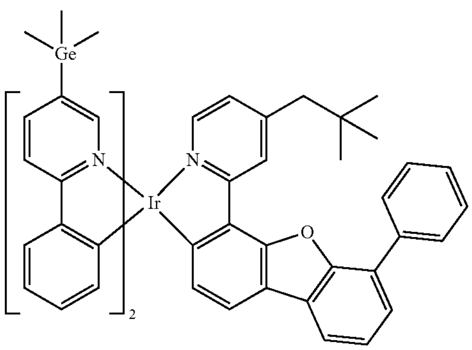
1747
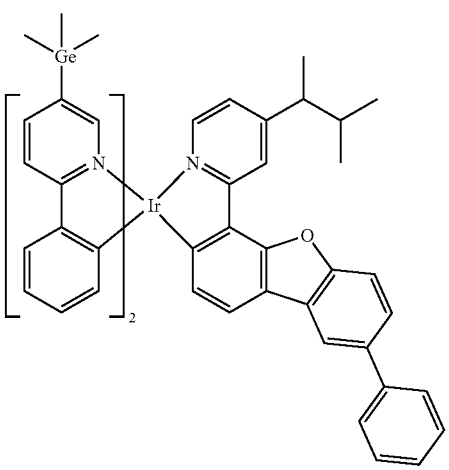
1748
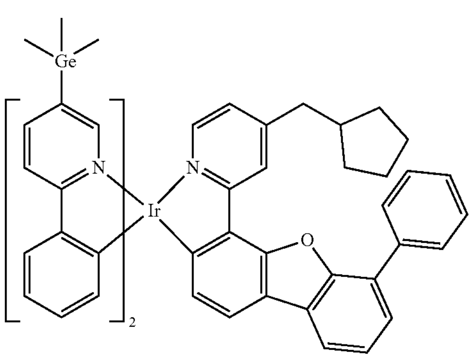
-continued
1749
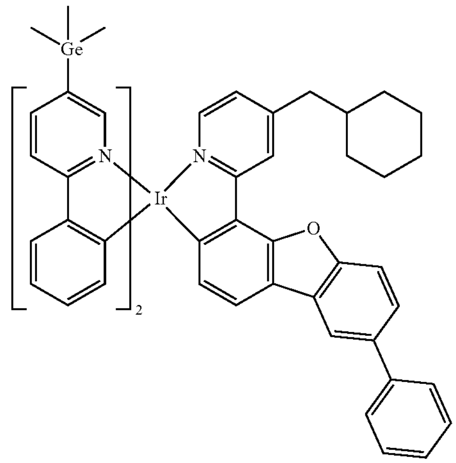
1750
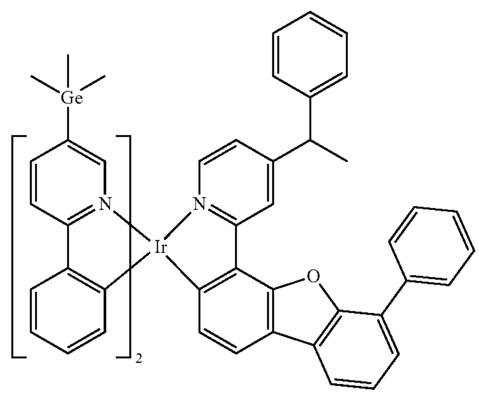
1751
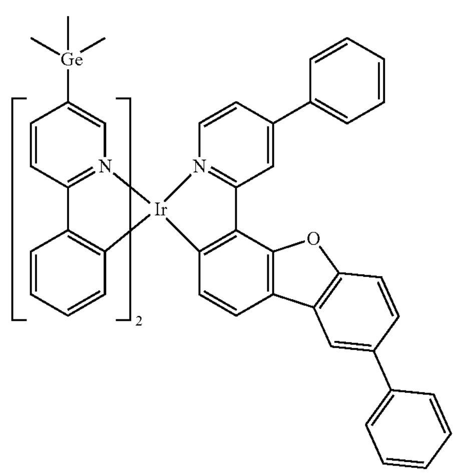

-continued
1752
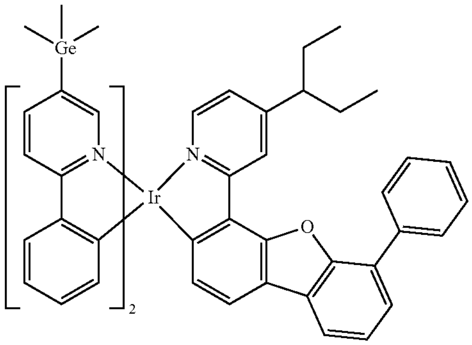
1753
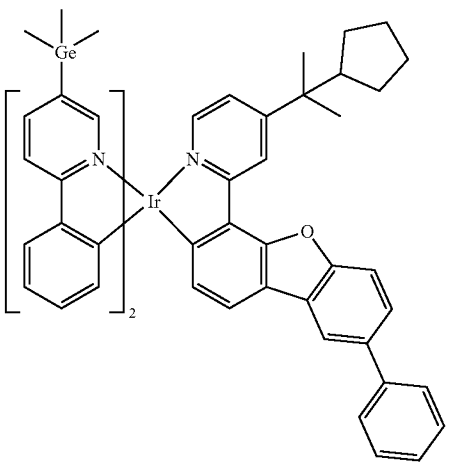
1754
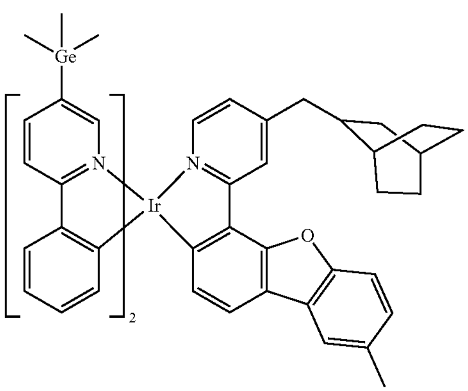
1755
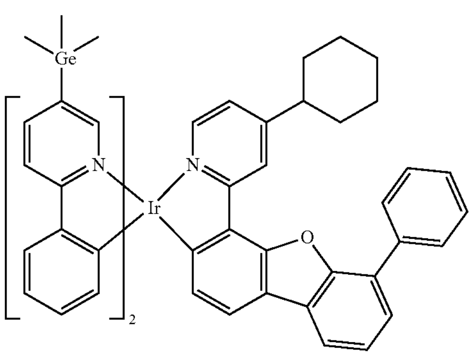
-continued
1756
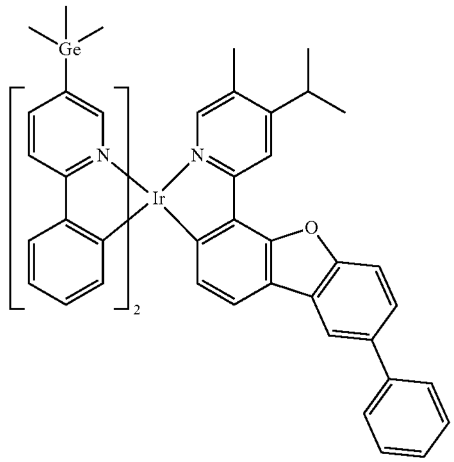
1757
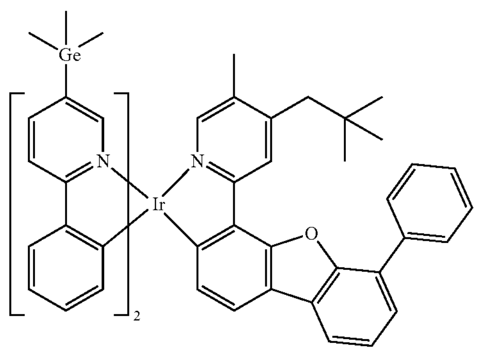
1758
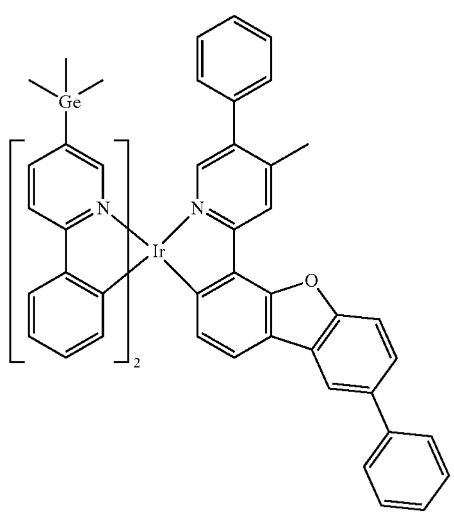

-continued
1759
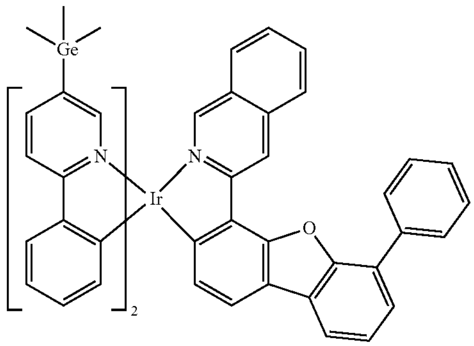
1760
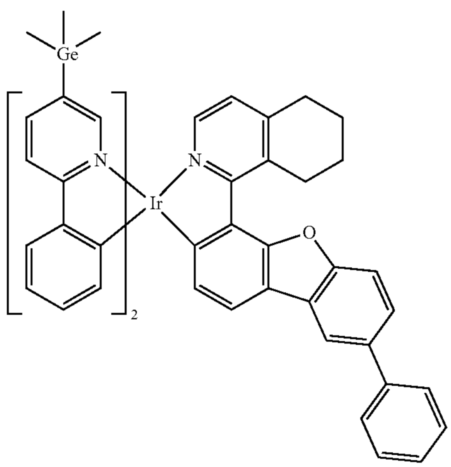
1761
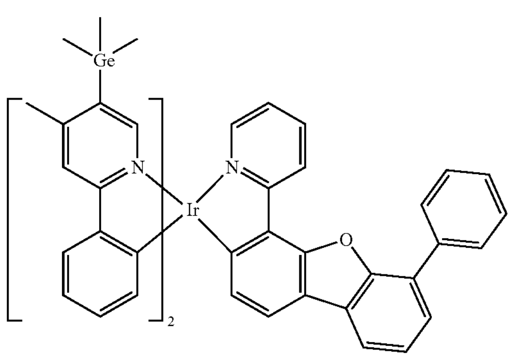
-continued
1762
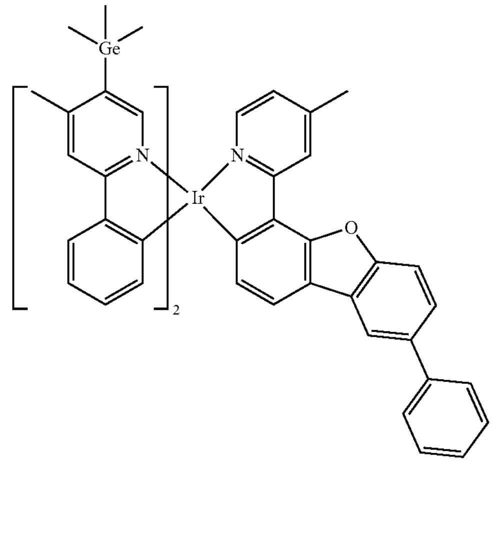
1763
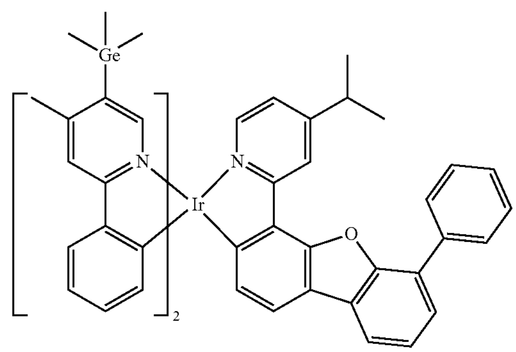
1764
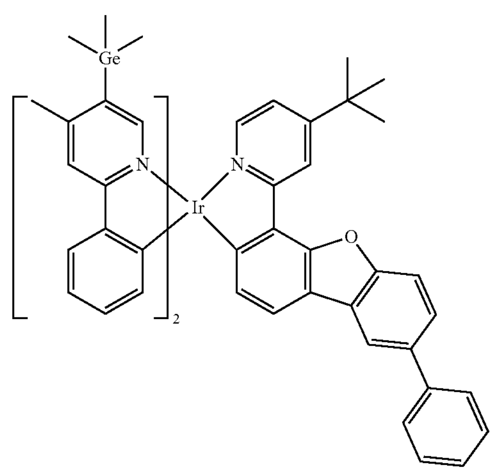

-continued
1765
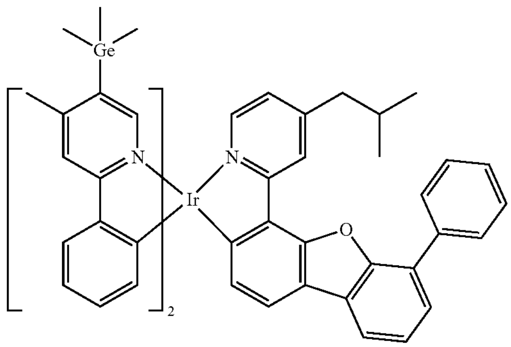
1766
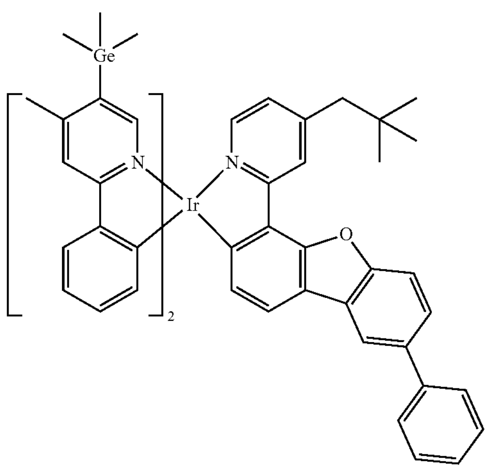
1767
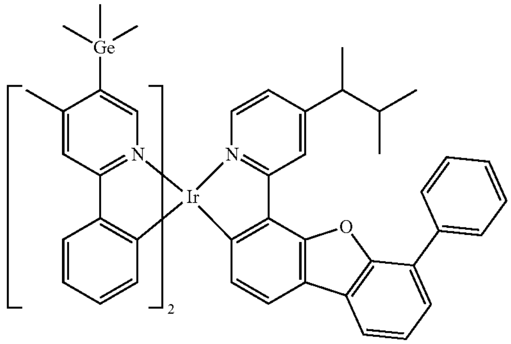
-continued
1768
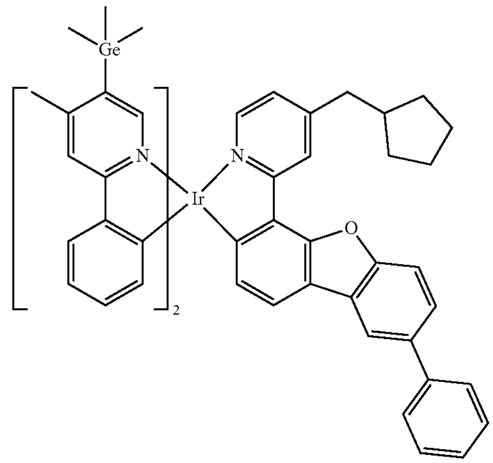
1769
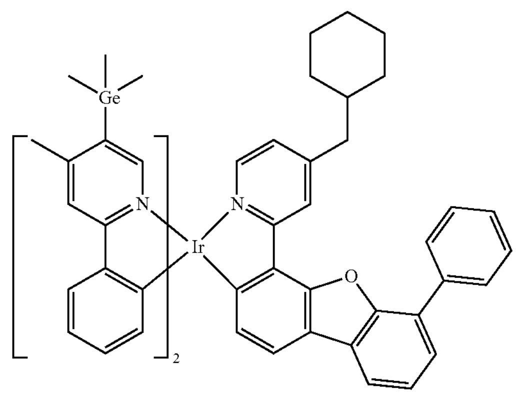
1770
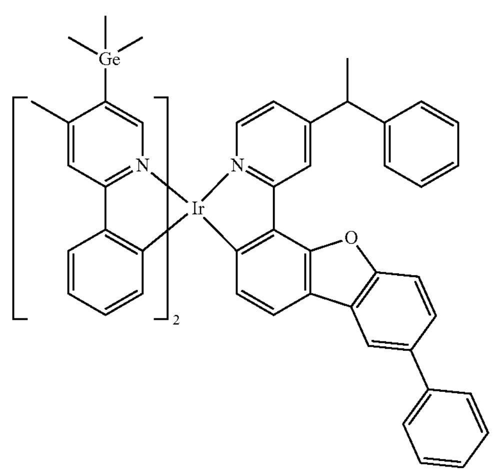

-continued
1771
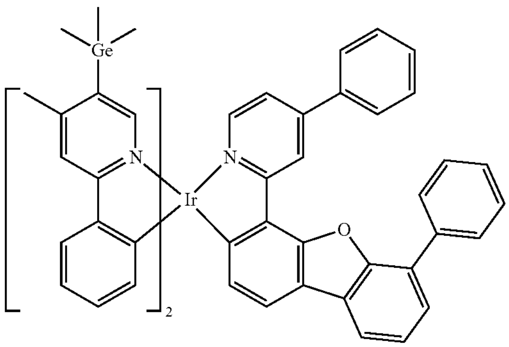
1772
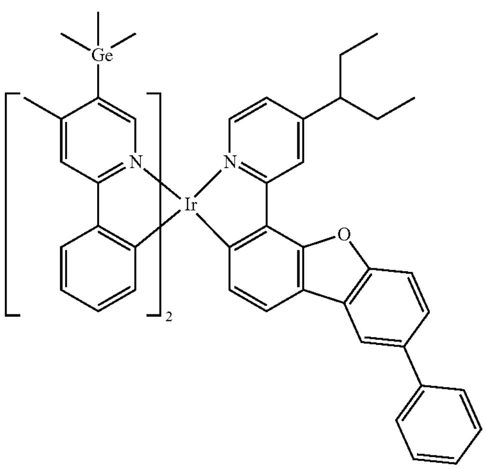
1773
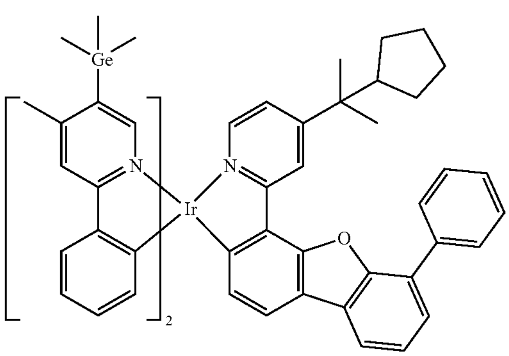
-continued
1774
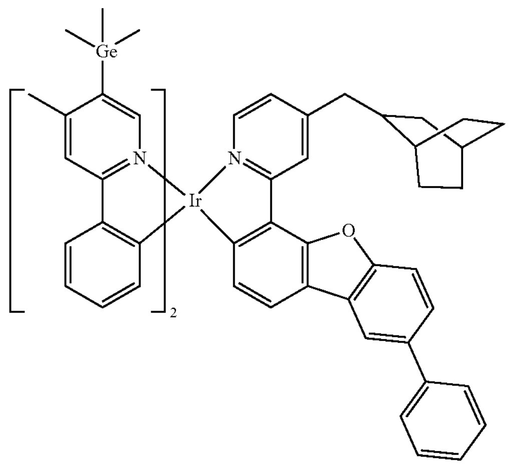
1775
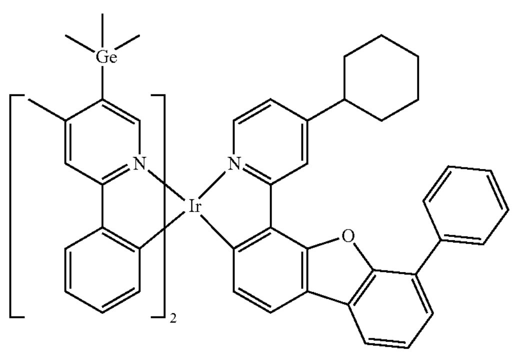
1776
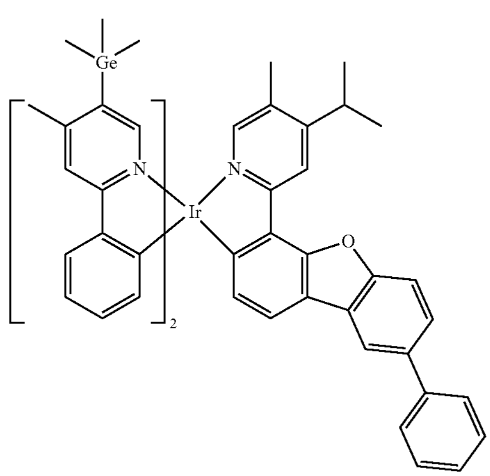

-continued
1777
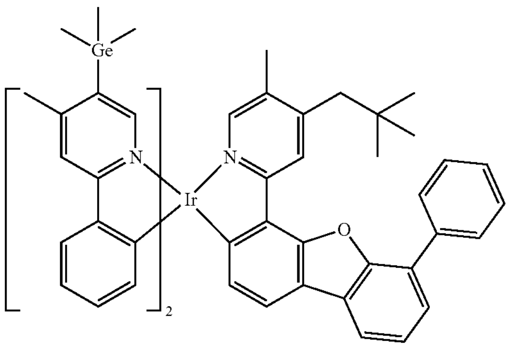
1778
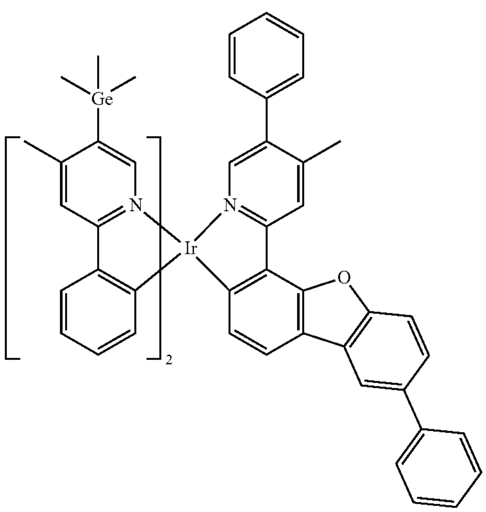
1779
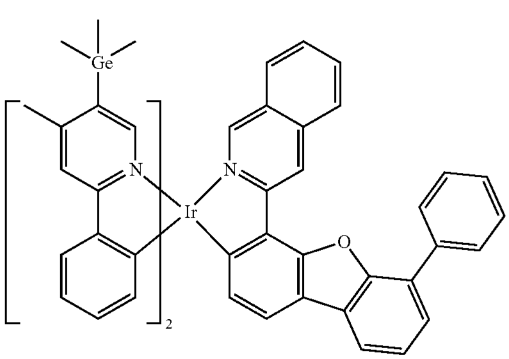
-continued
1780
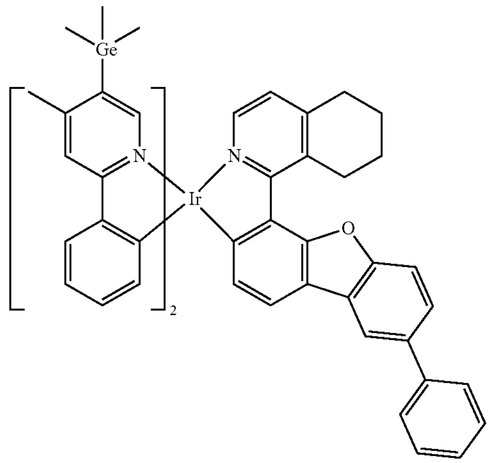
1781
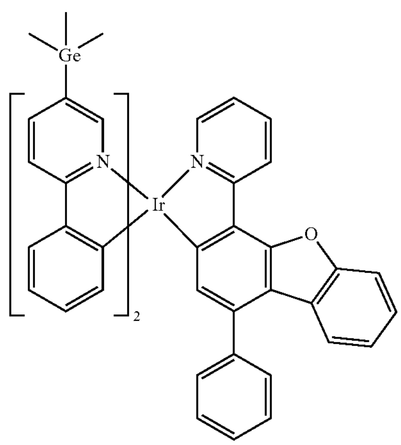
1782
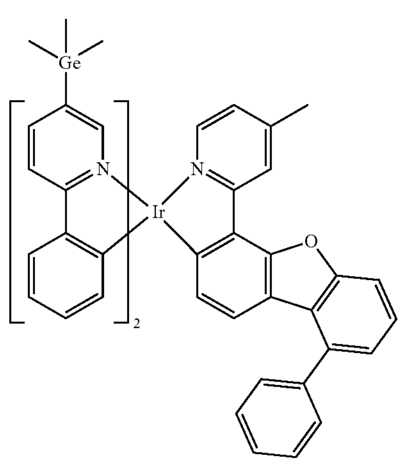

-continued
1783
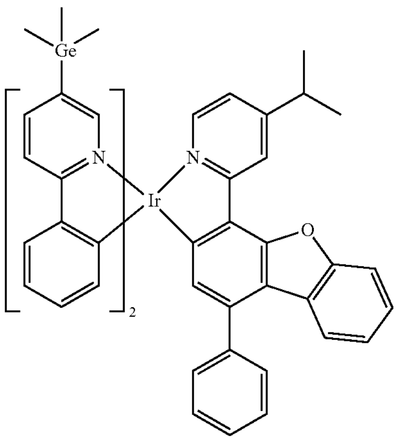
1784
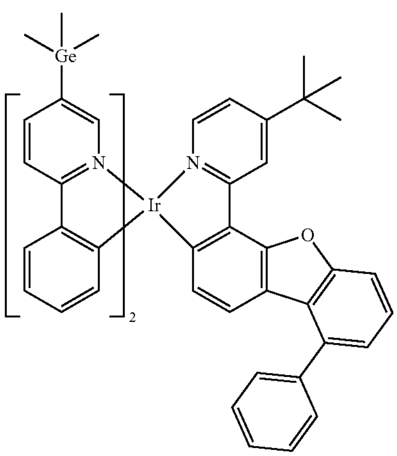
1785
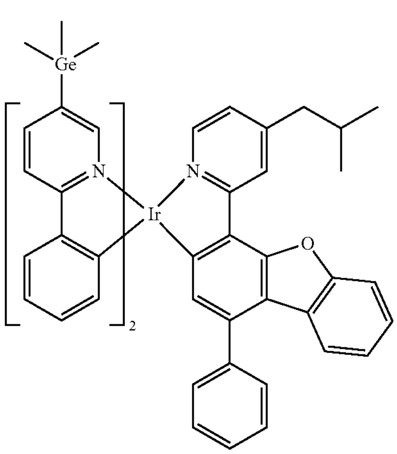
-continued
1786
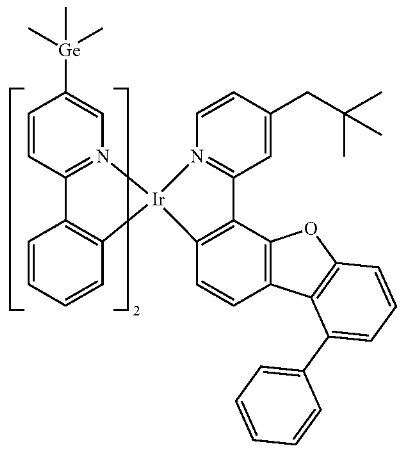
1787
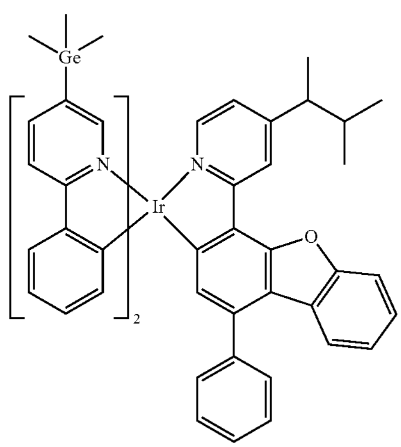
1788
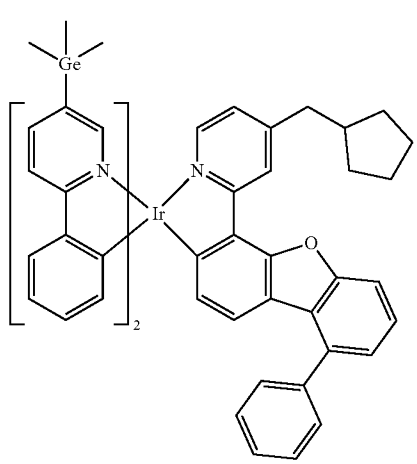

-continued
1789
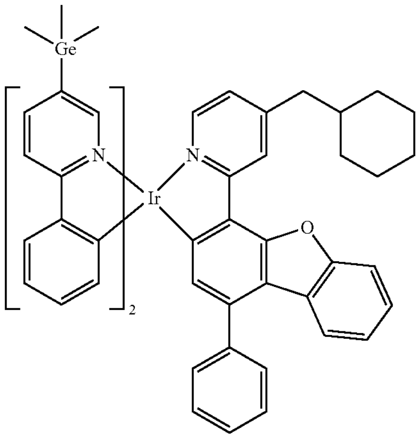
1790
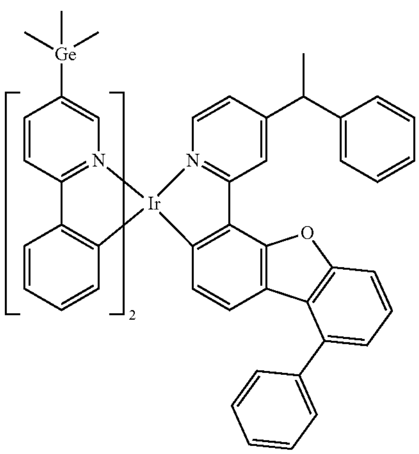
1791
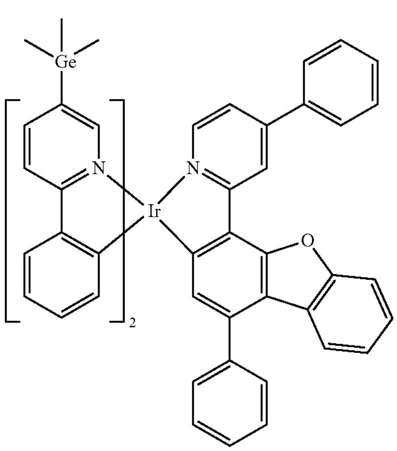
-continued
1792
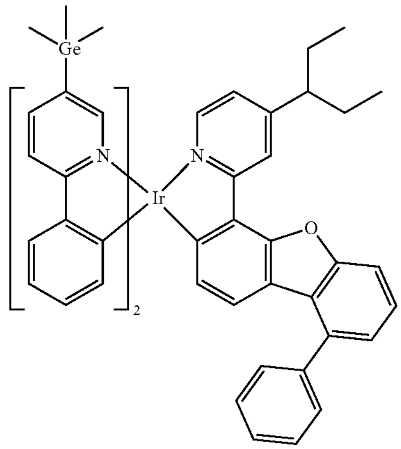
1793
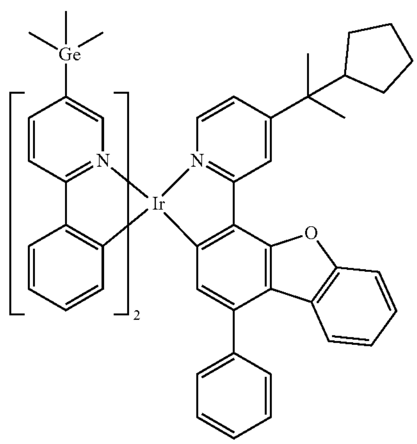
1794
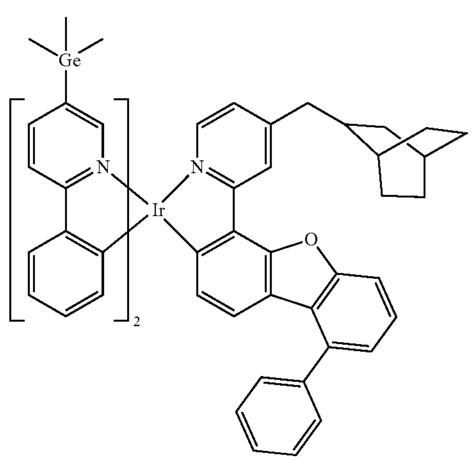

-continued
1795
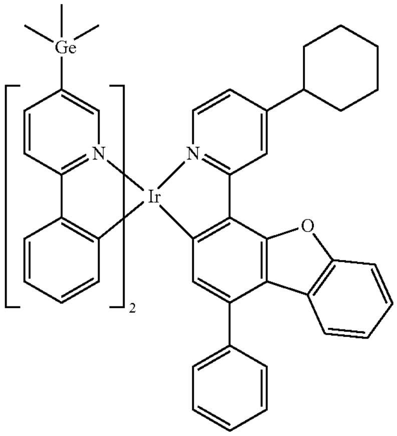
1796
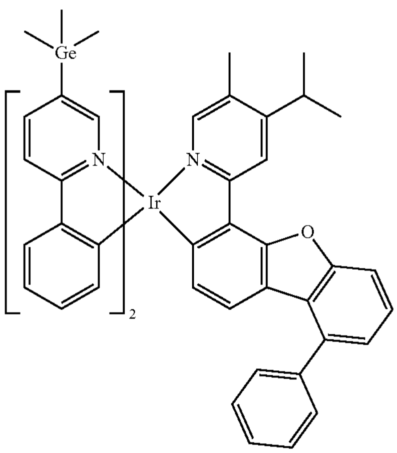
1797
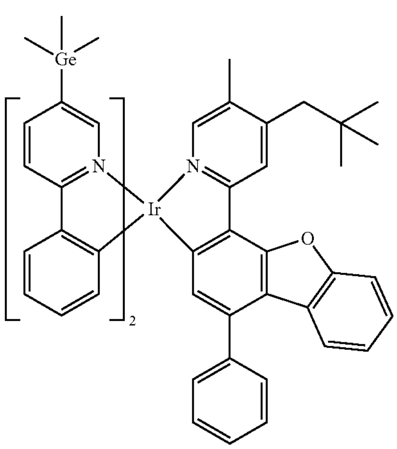
-continued
1798
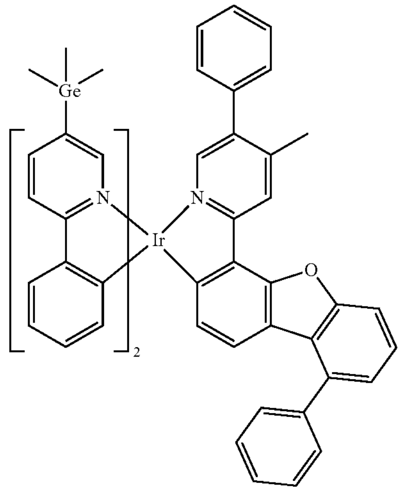
1799
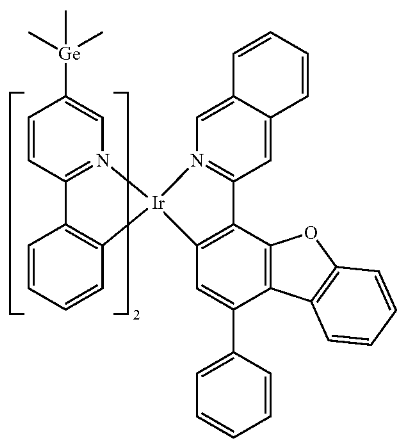
1800
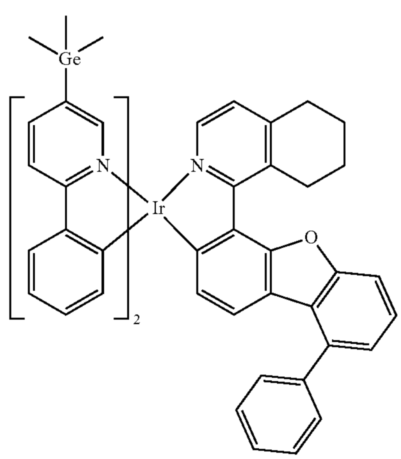

-continued
1801
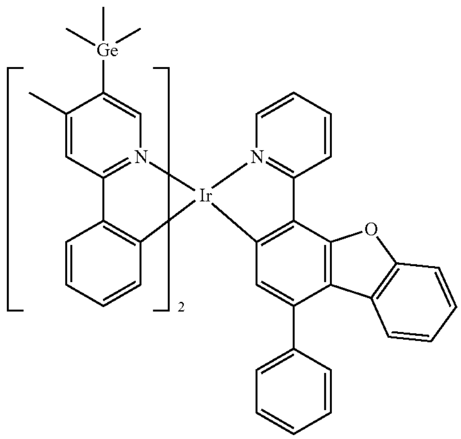
1802
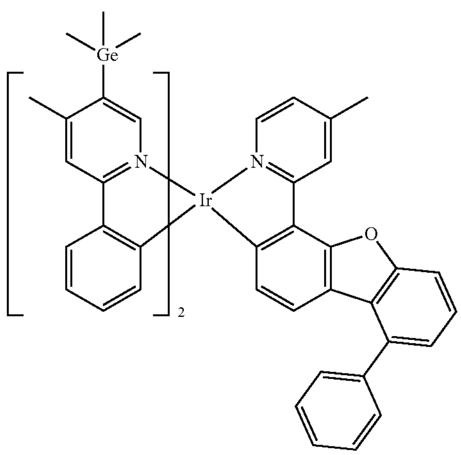
1803
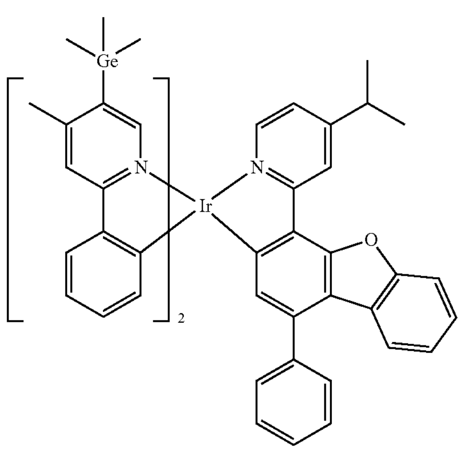
1804
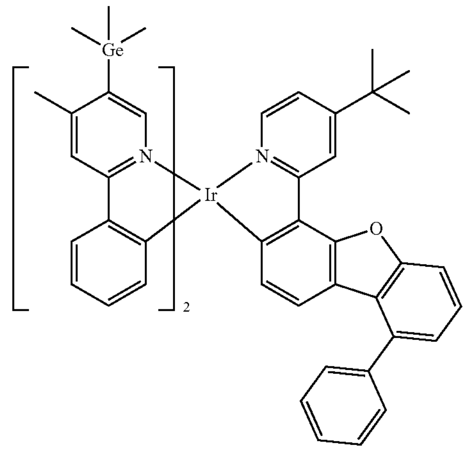
1805
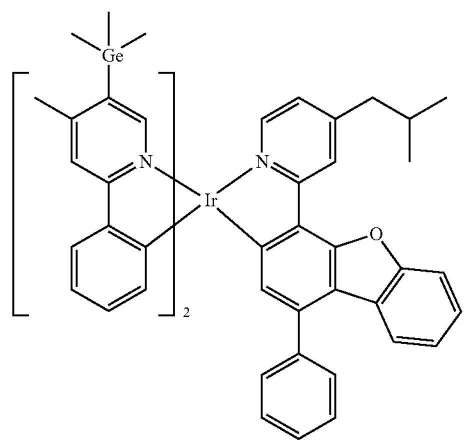
1806
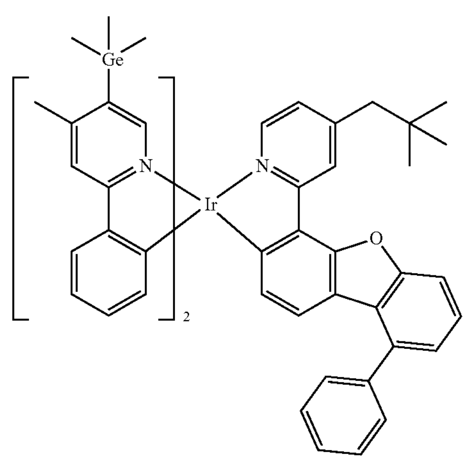

-continued
1807
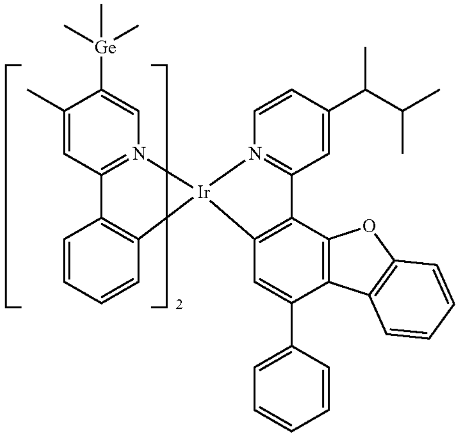
1808
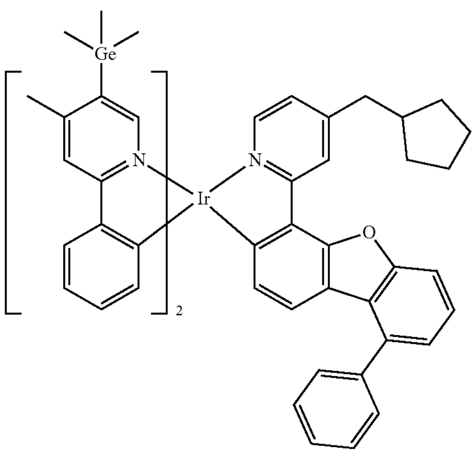
1809
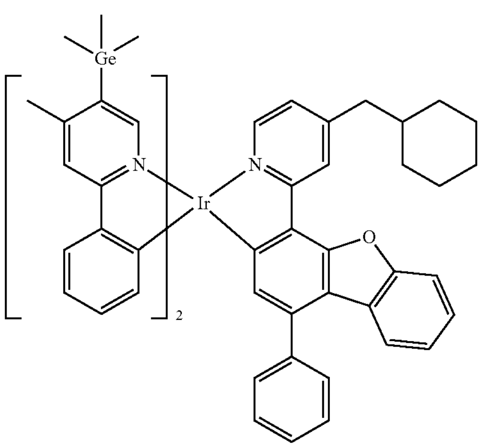
-continued
1810
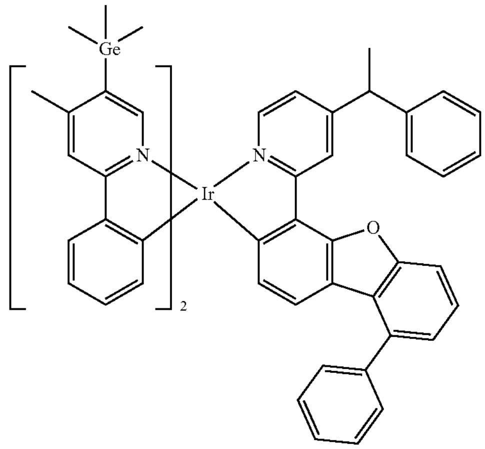
1811
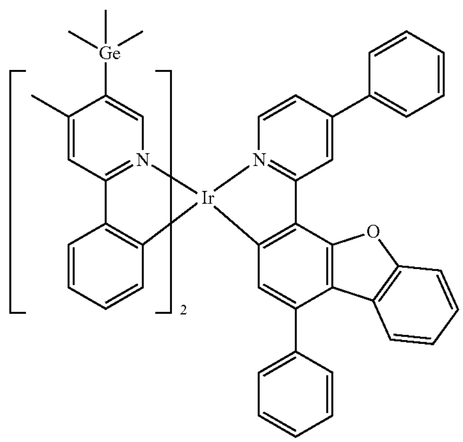
1812
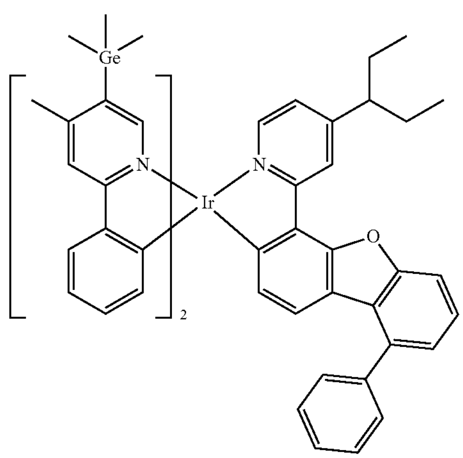

-continued
1813
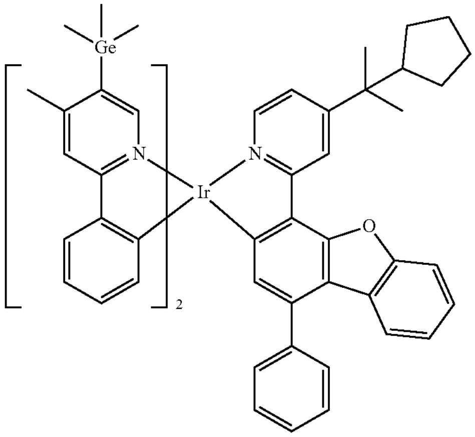
1814
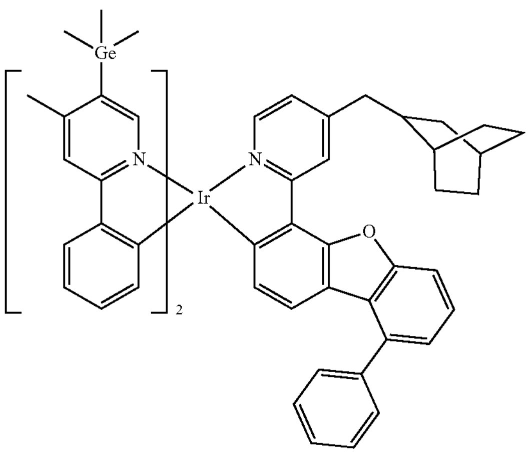
1815
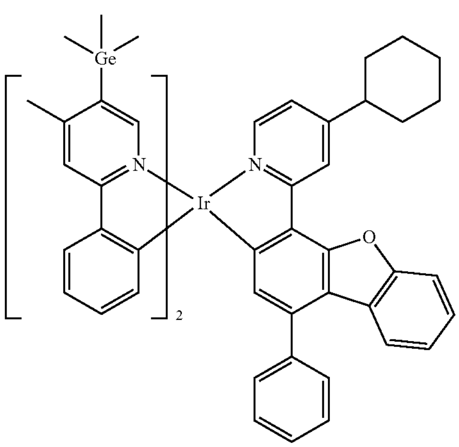
-continued
1816
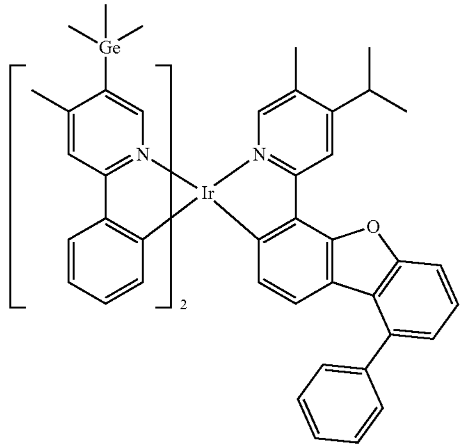
1817
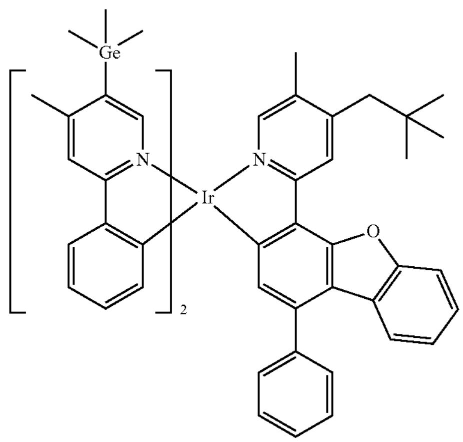
1818
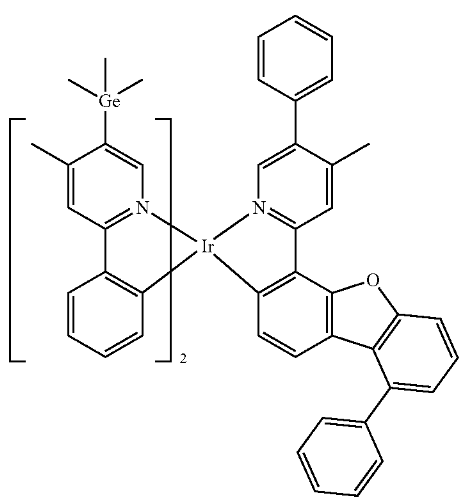

-continued
1819
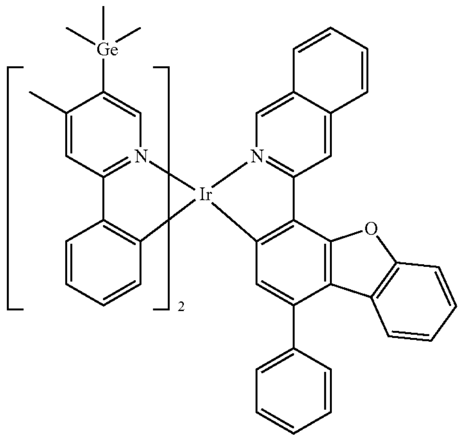
1820
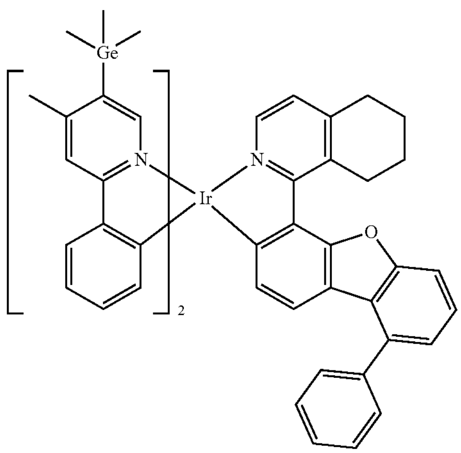
1821
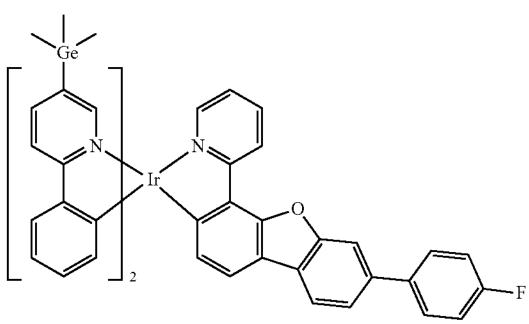
1822
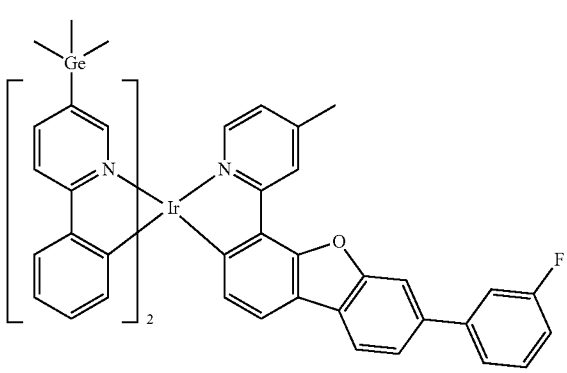
-continued
1823
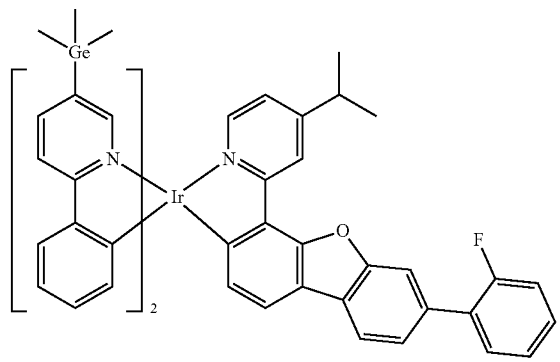
1824
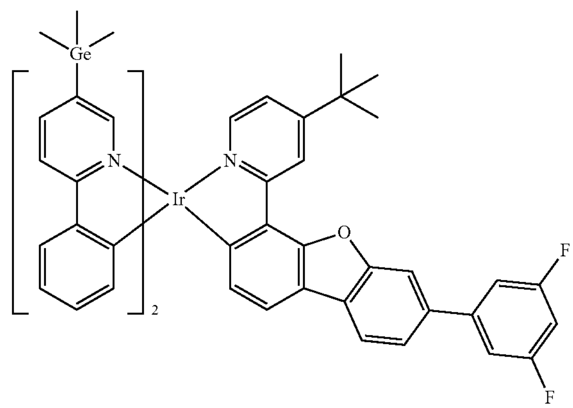
1825
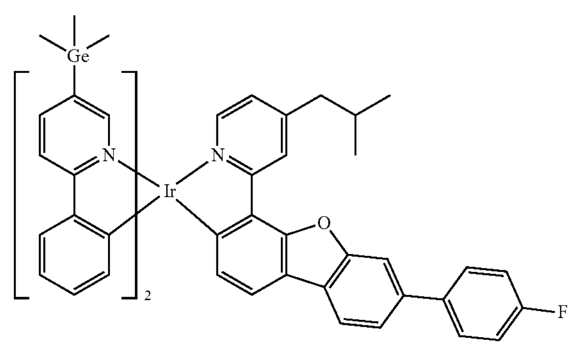
1826
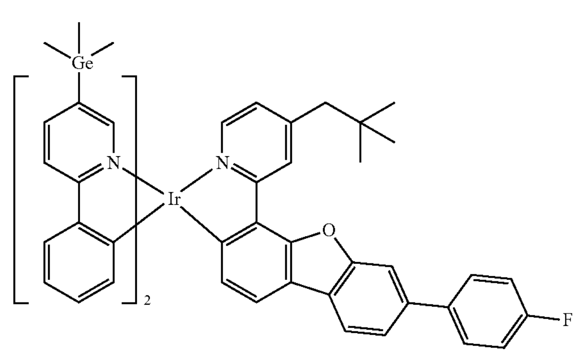

-continued
1827
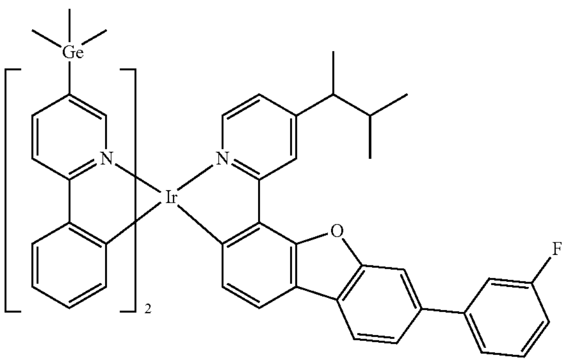
1828
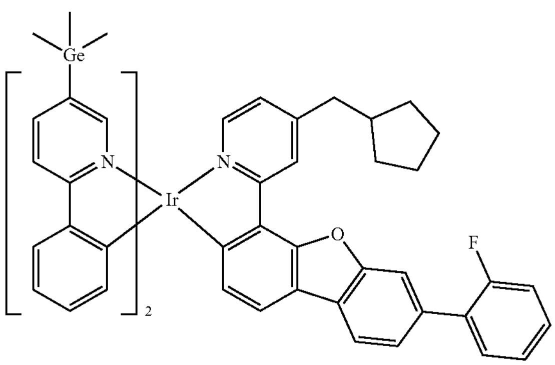
1829
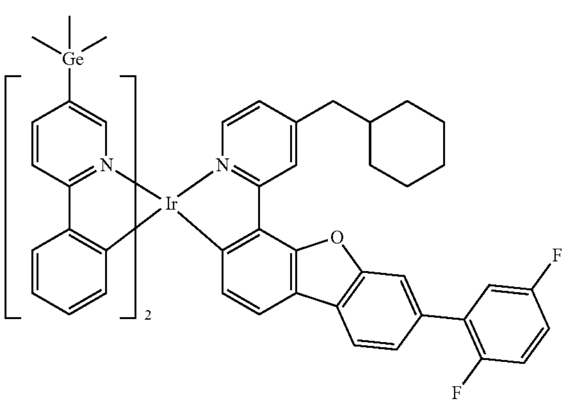
1830
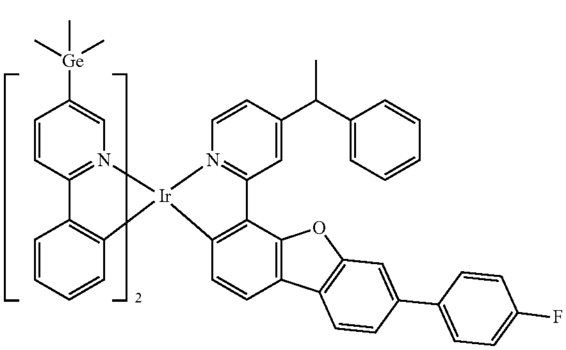
-continued
1831
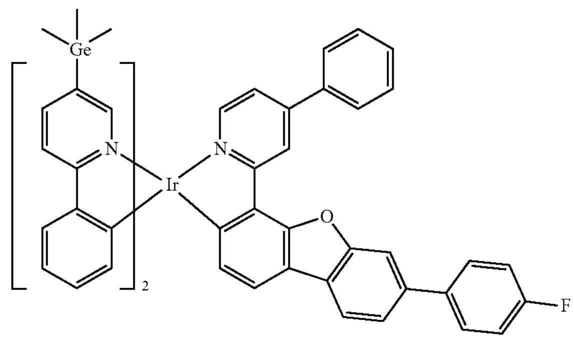
1832
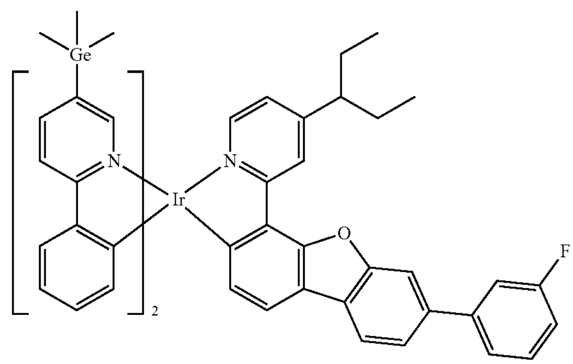
1833
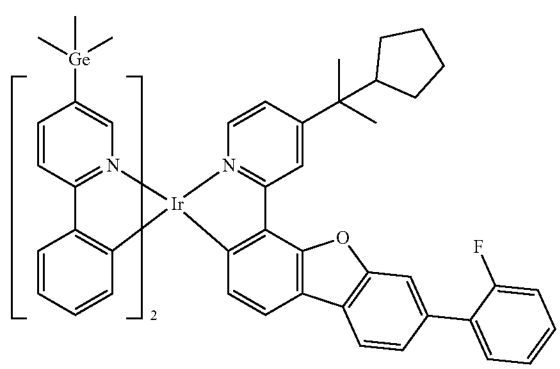
1834
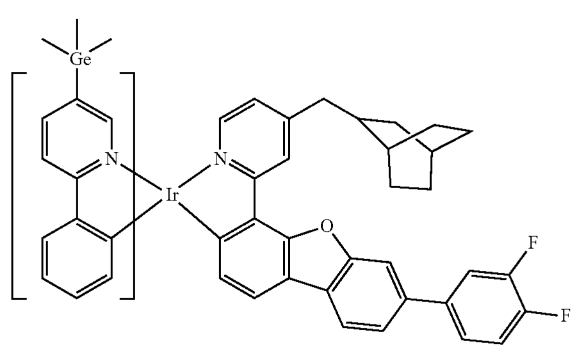

1835
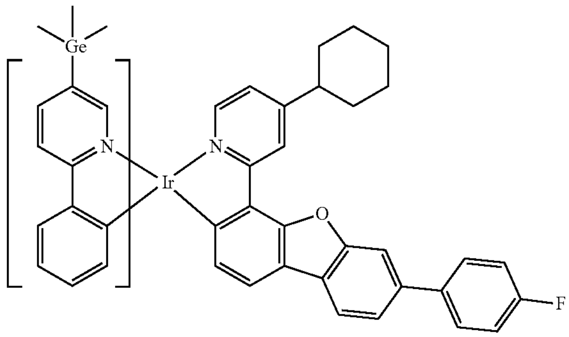
1836
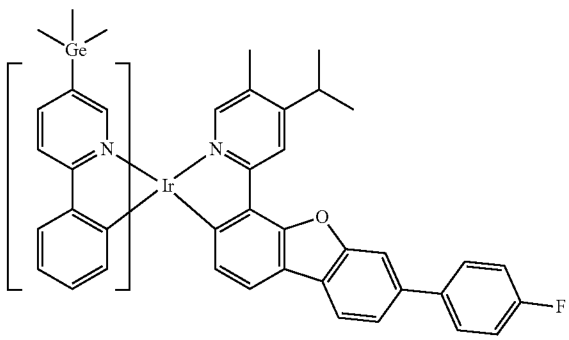
1837
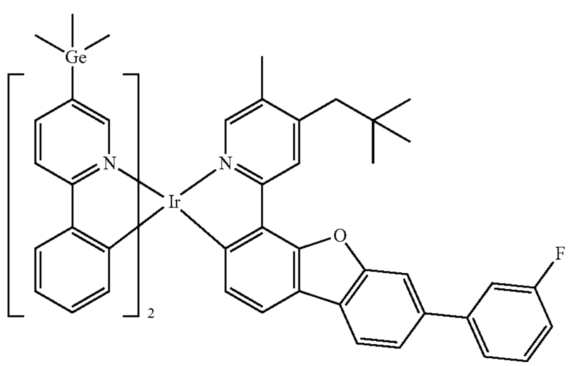
1838
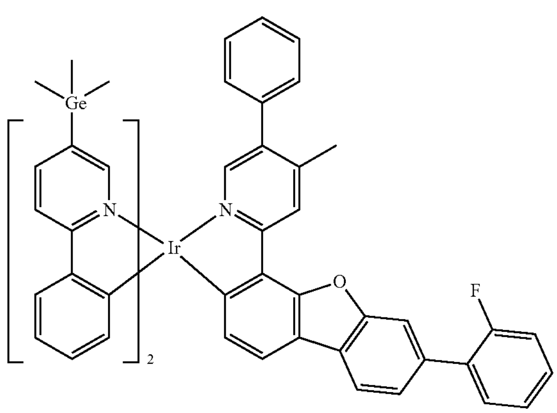
1839
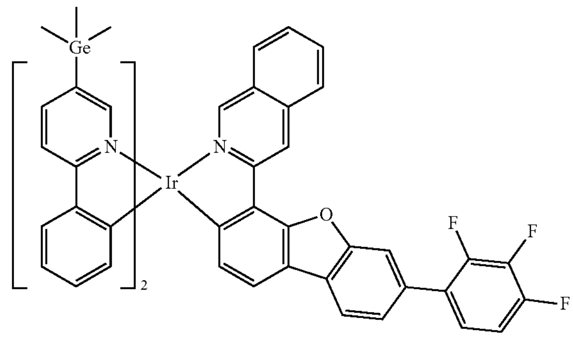
1840
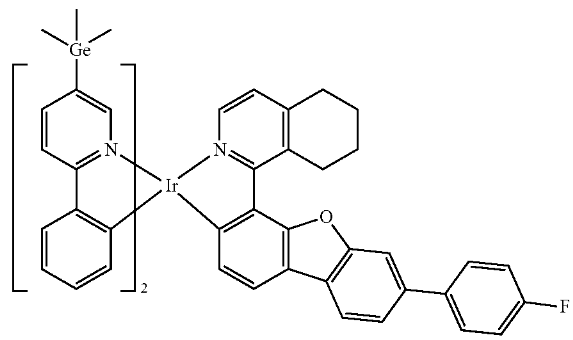
1841
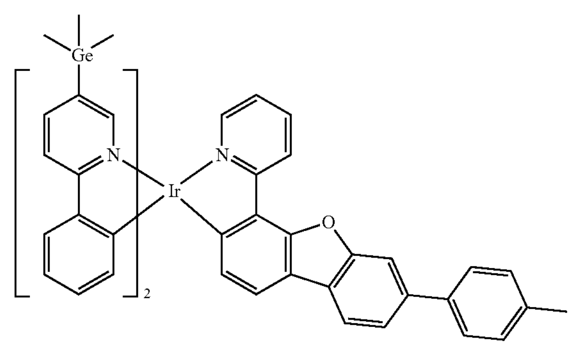
1842
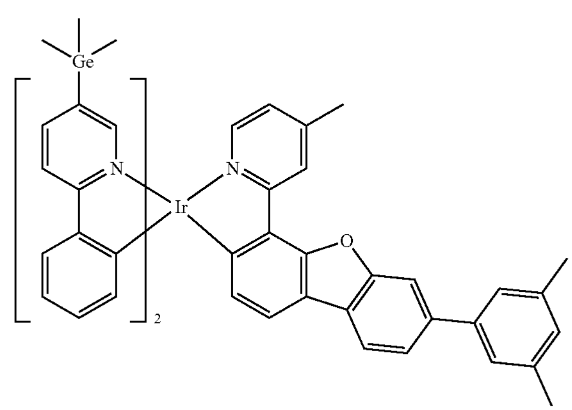

-continued
1843
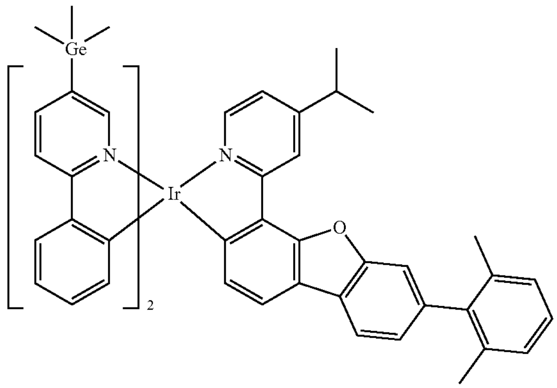
1844
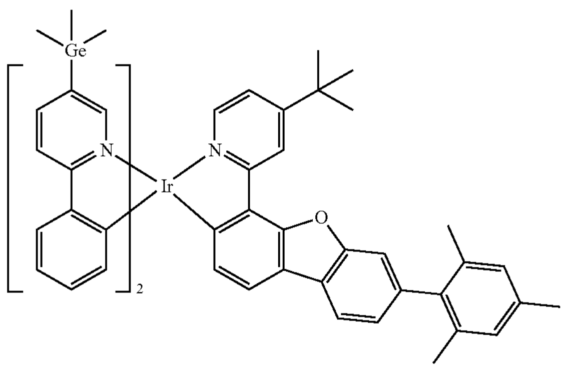
1845
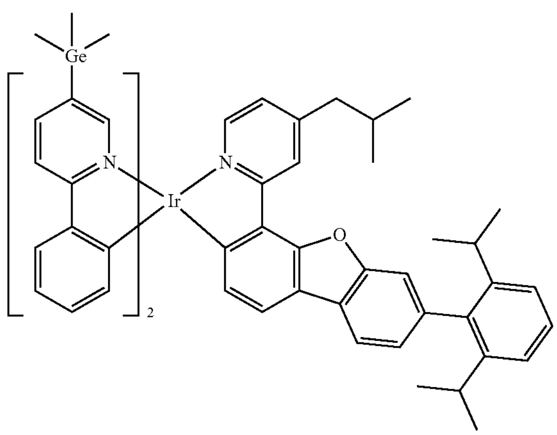
1846
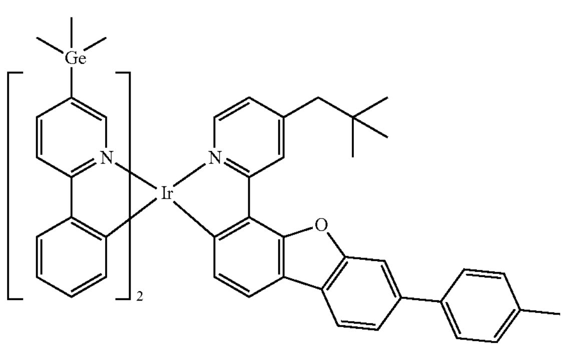
-continued
1847
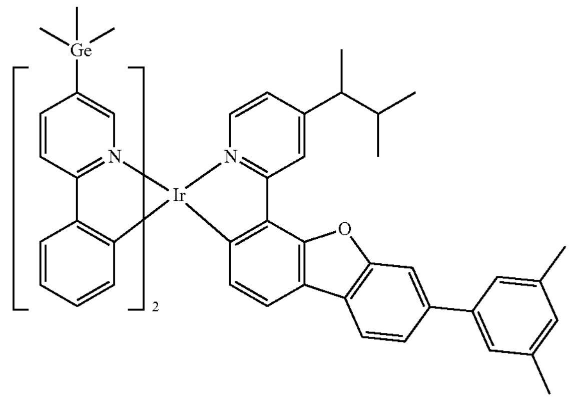
1848
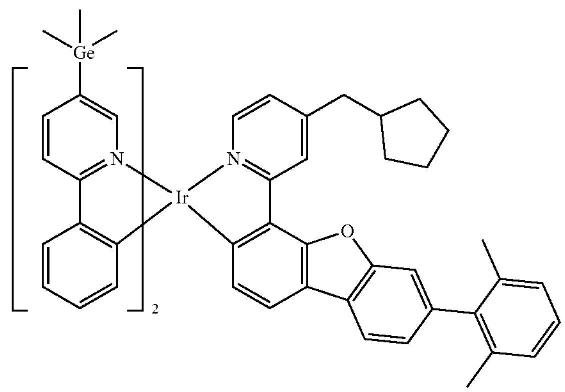
1849
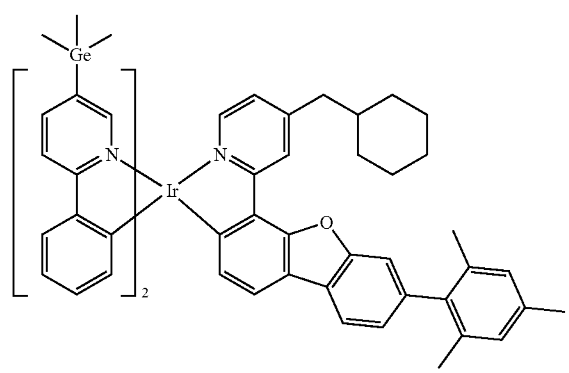
1850
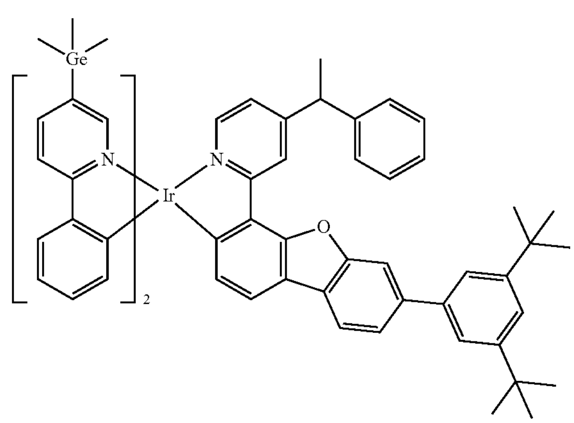

-continued
1851
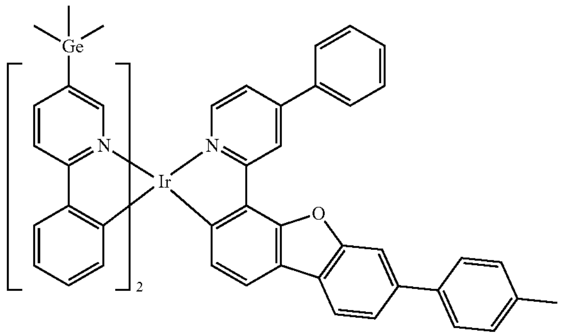
1852
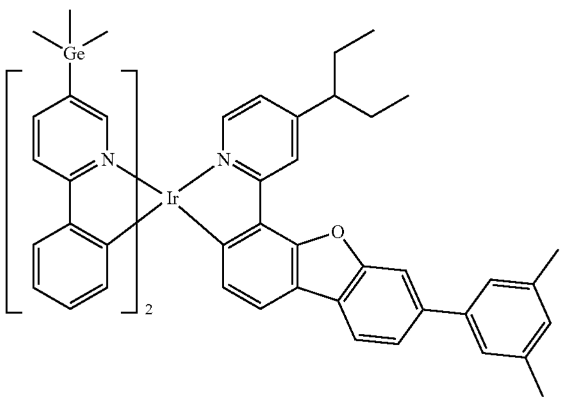
1853
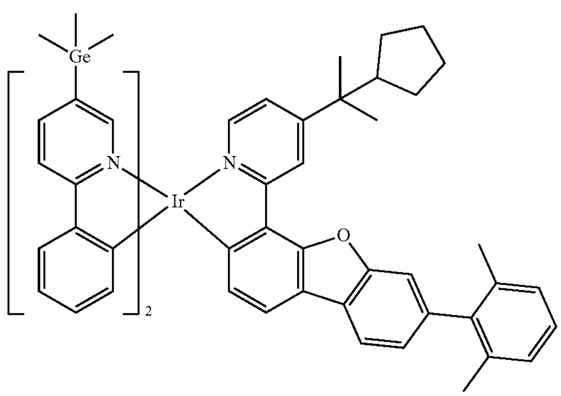
1854
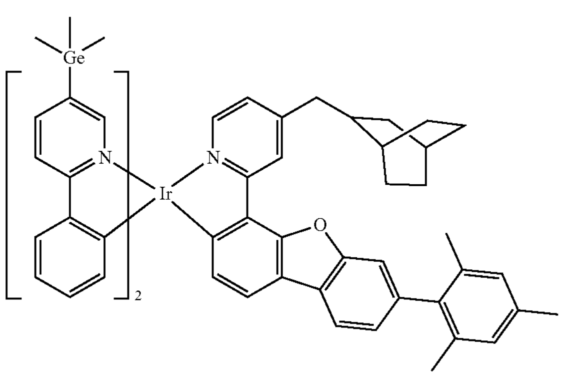
-continued
1855
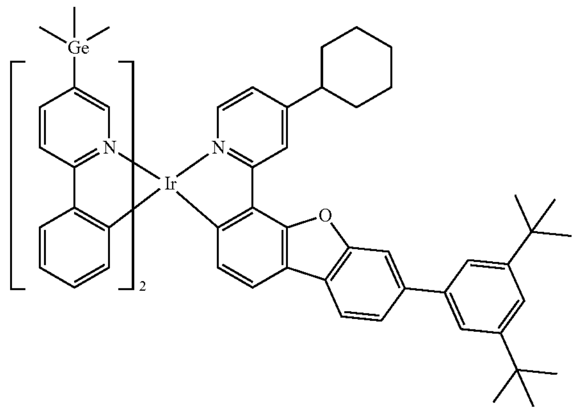
1856
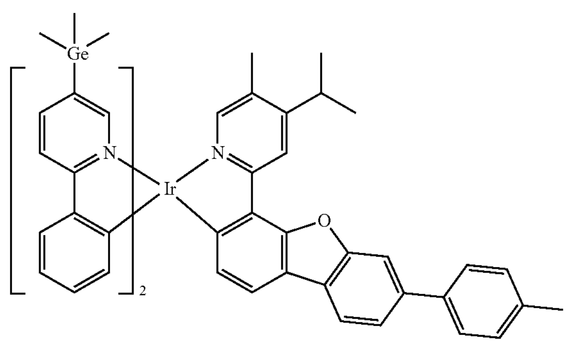
1857
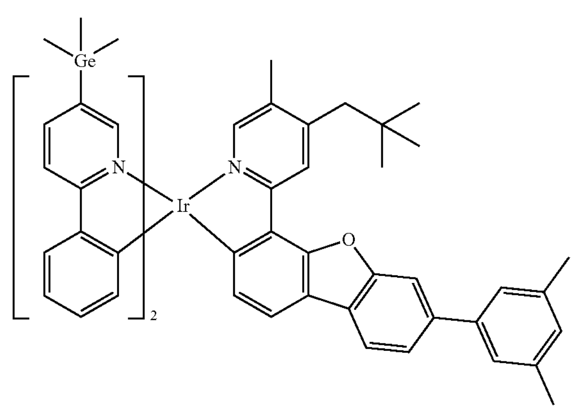

-continued
1858
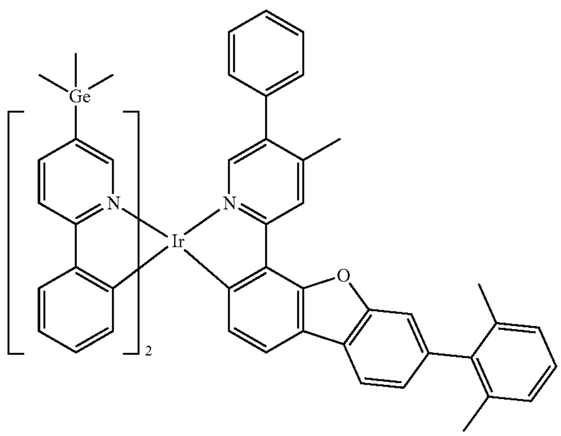
1859
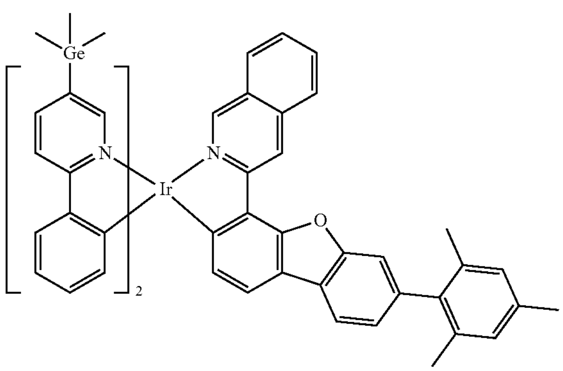
1860
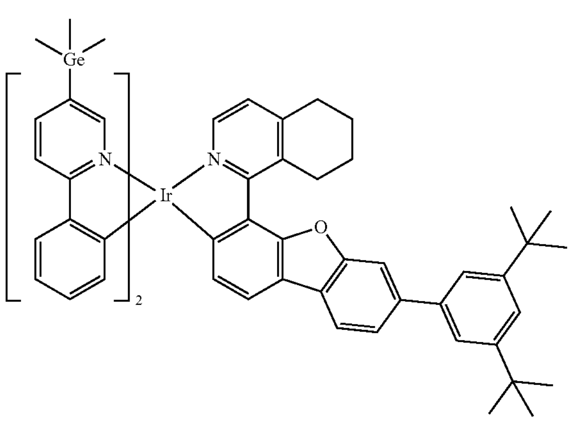
-continued
1861
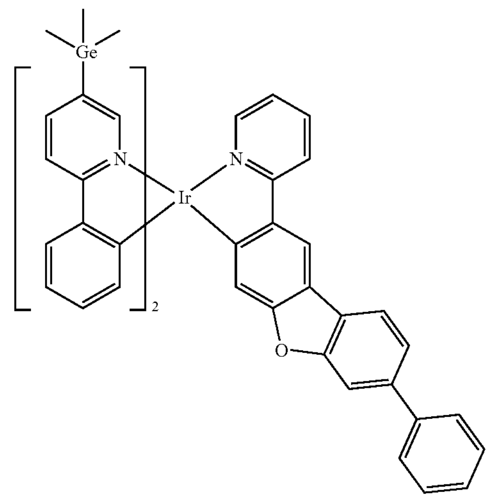
1862
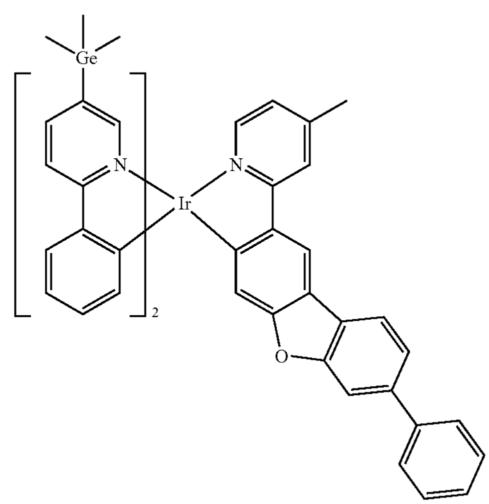
1863
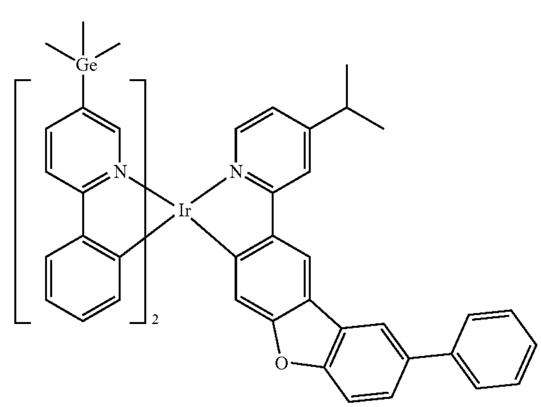

-continued
1864
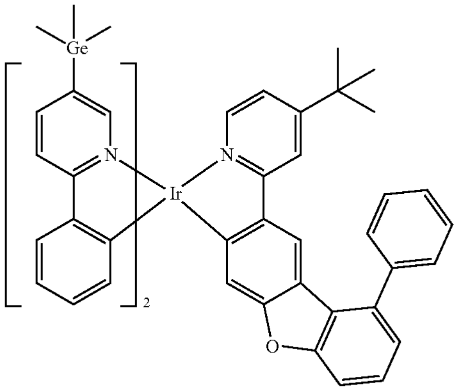
1865
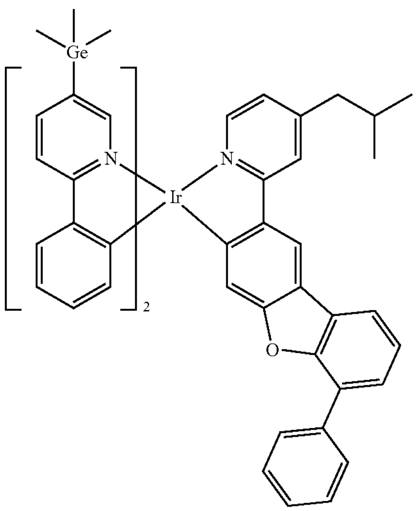
1866
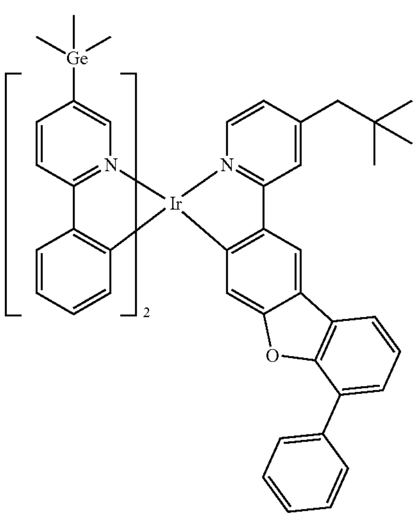
-continued
1867
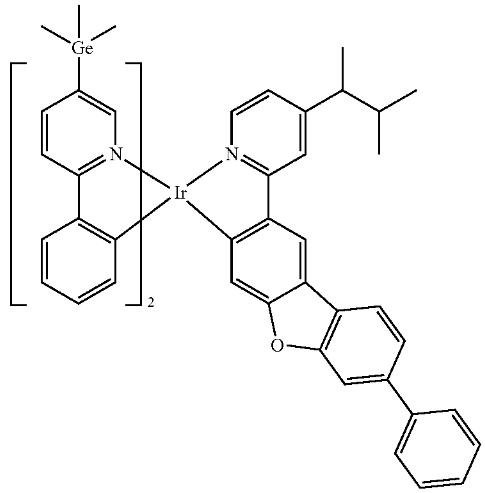
1868
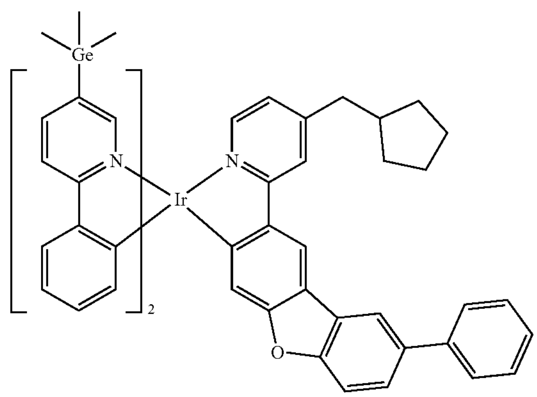
1869
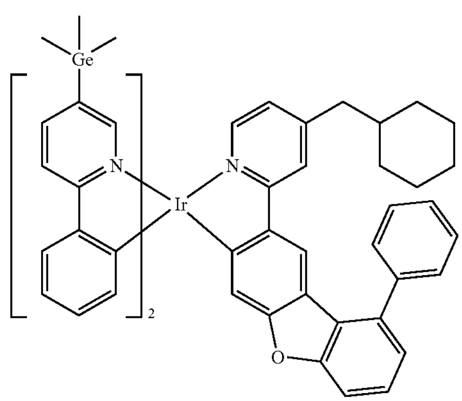

-continued
1870
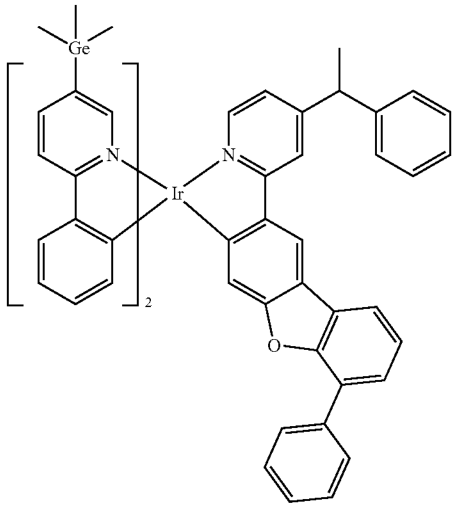
1871
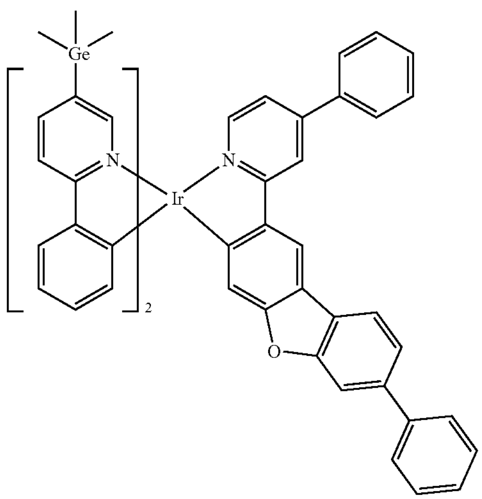
1872
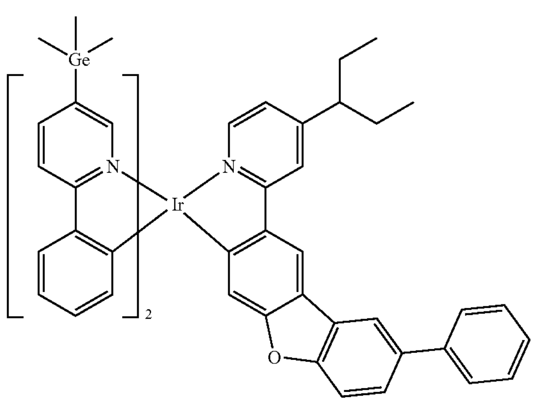
-continued
1873
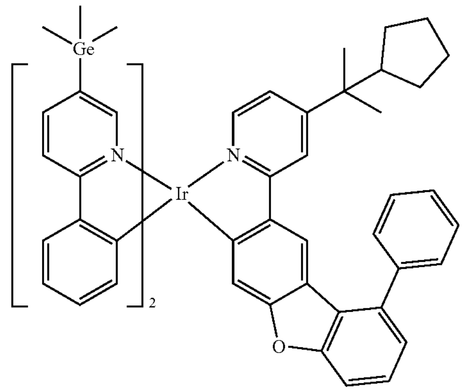
1874
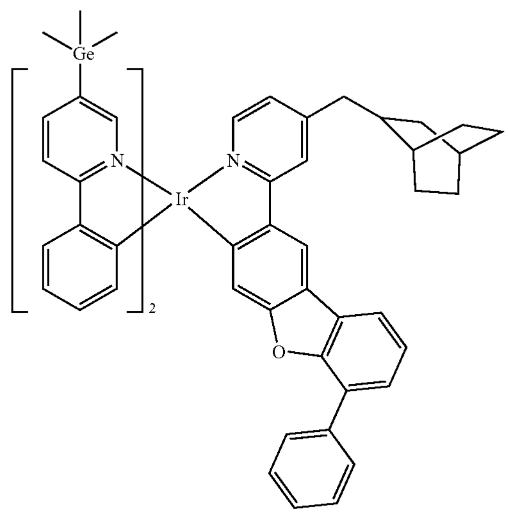
1875
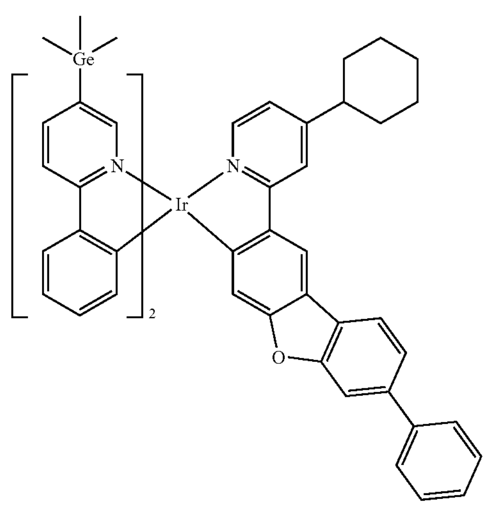

-continued
1876
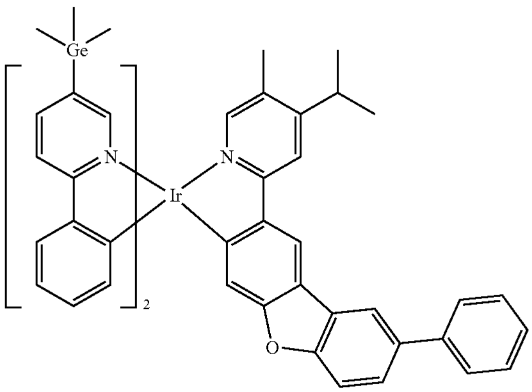
1877
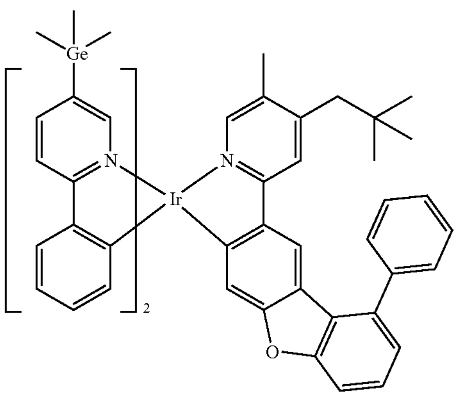
1878
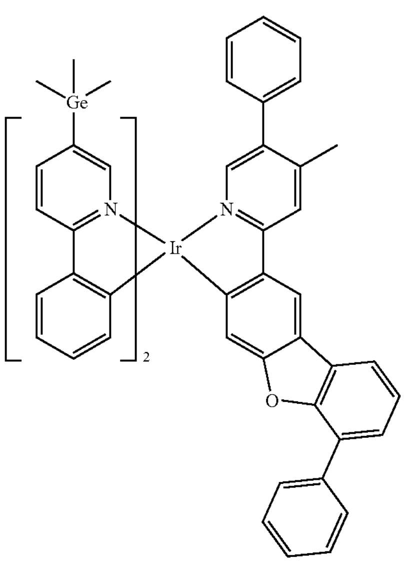
-continued
1879
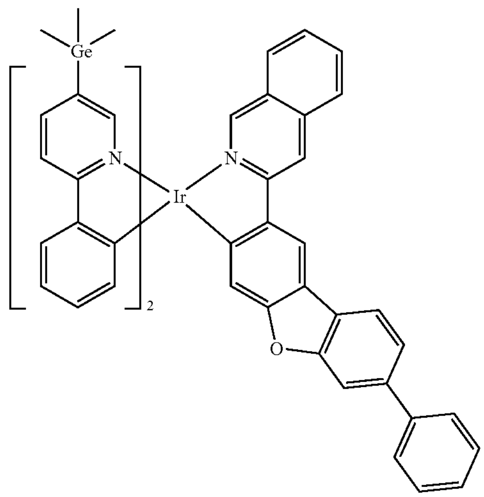
1880
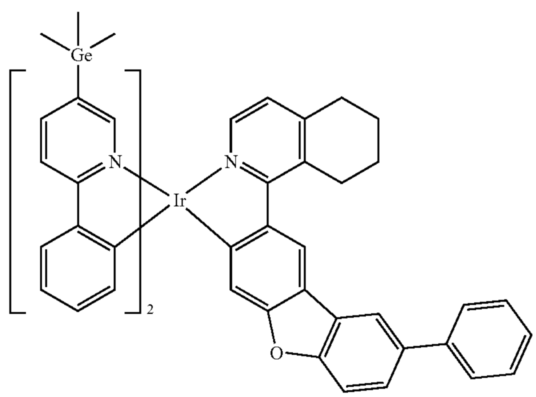
1881
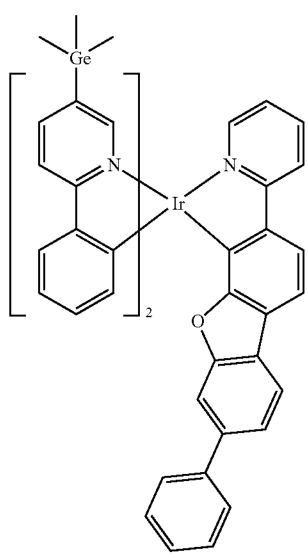

-continued
1882
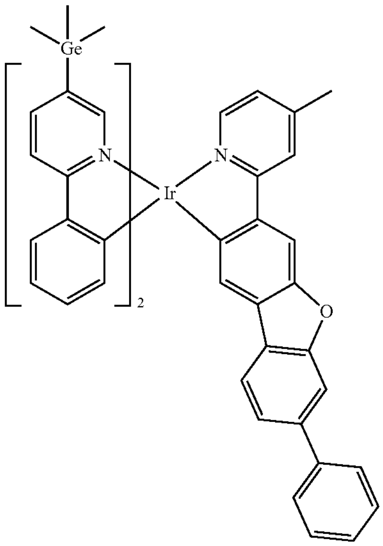
1883
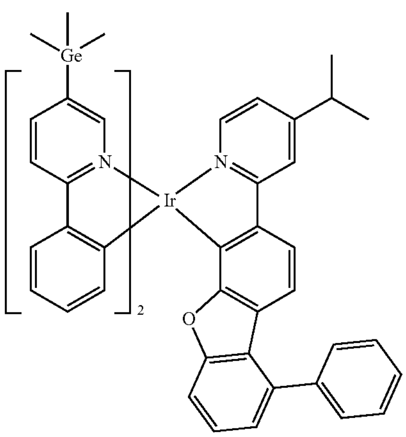
1884
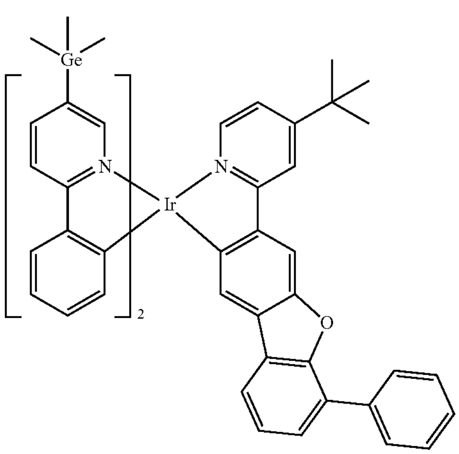
-continued
1885
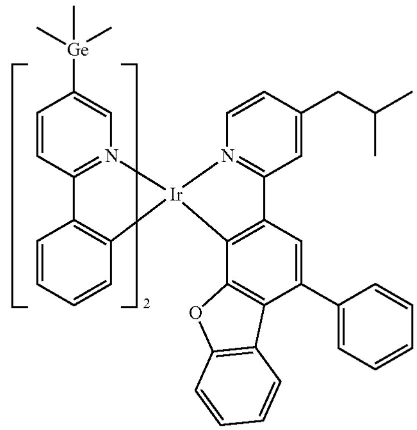
1886
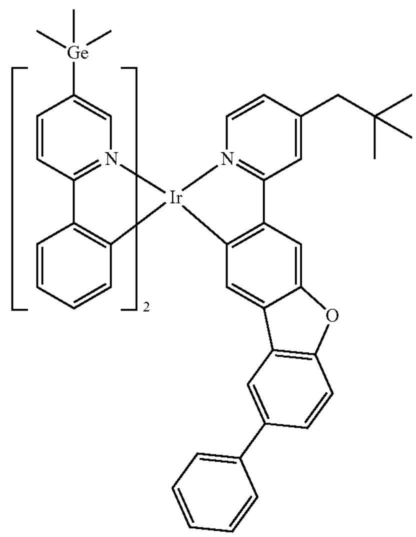
1887
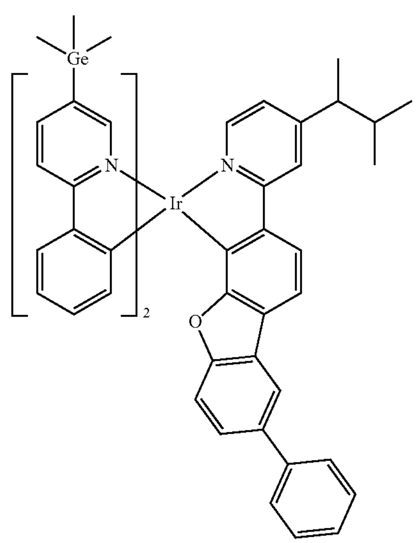

1888
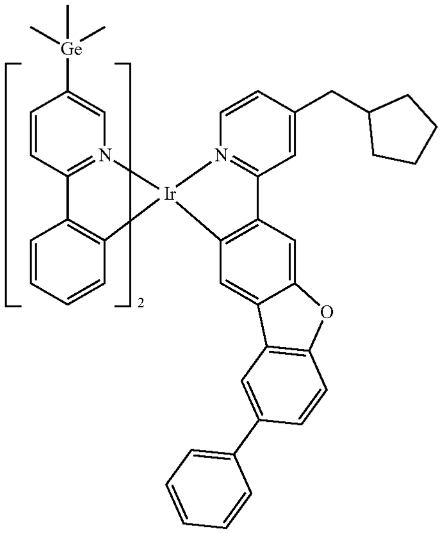
1889
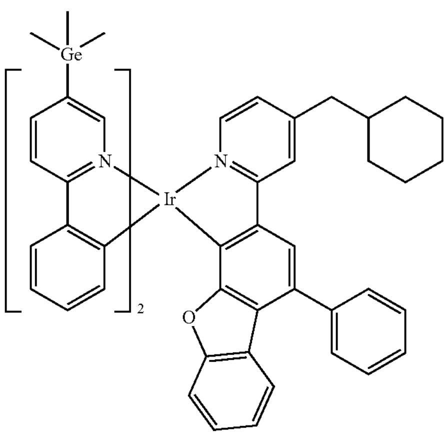
1890
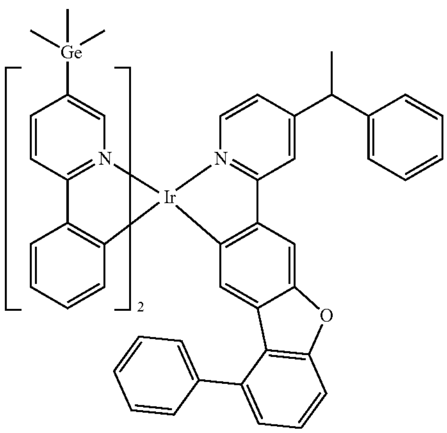
1891
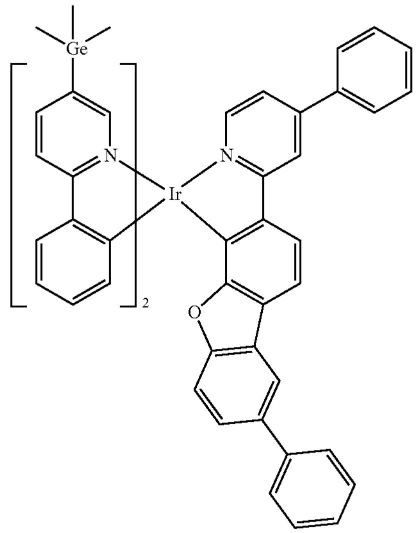
1892
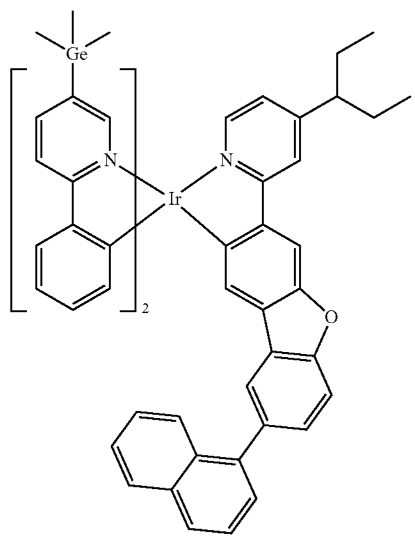
1893
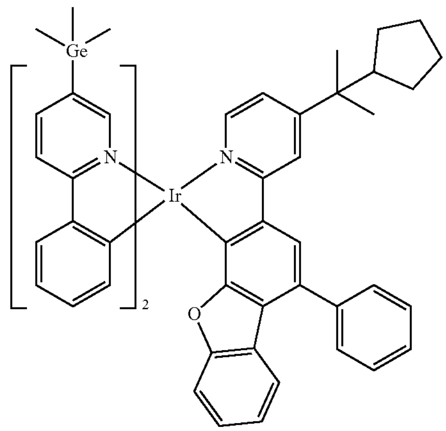

1894
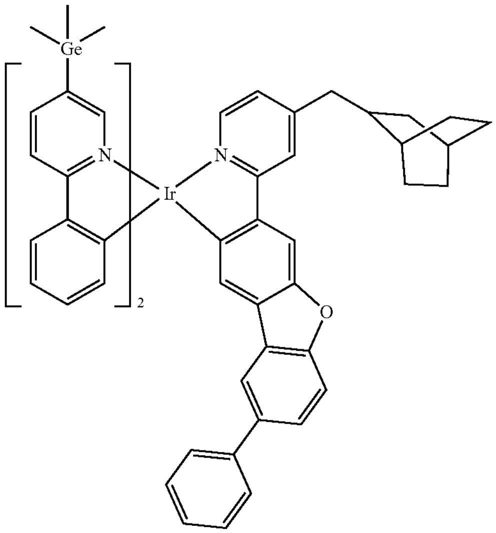
1895
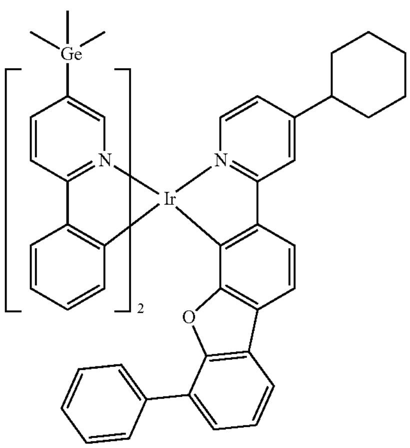
1896
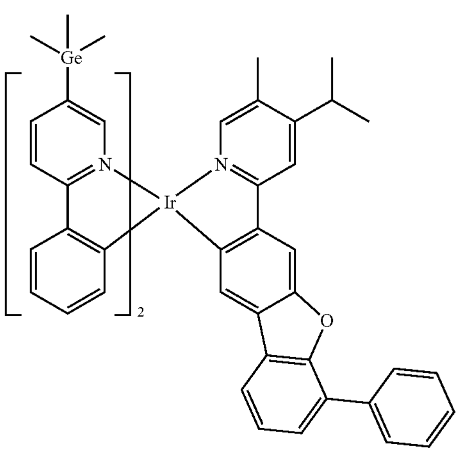
1897
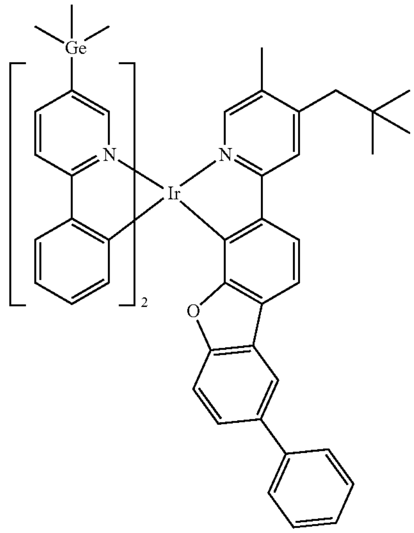
1898
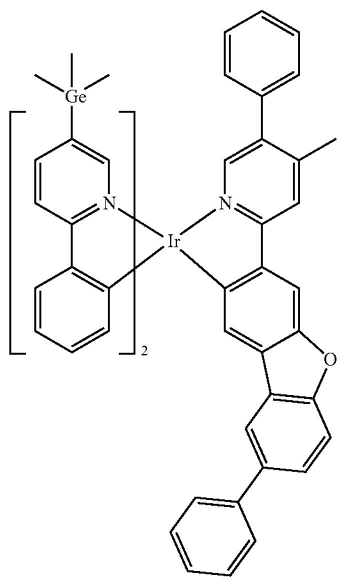
1899
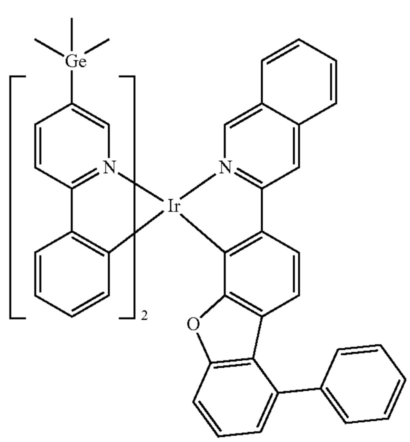

-continued
1900
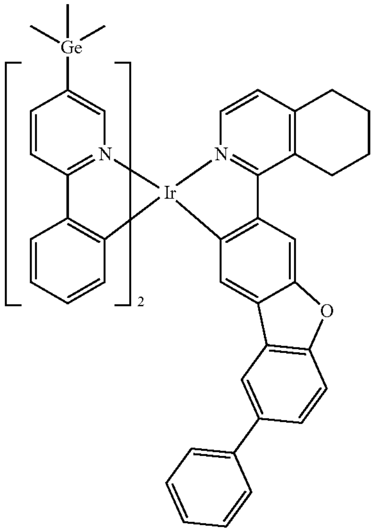
1901
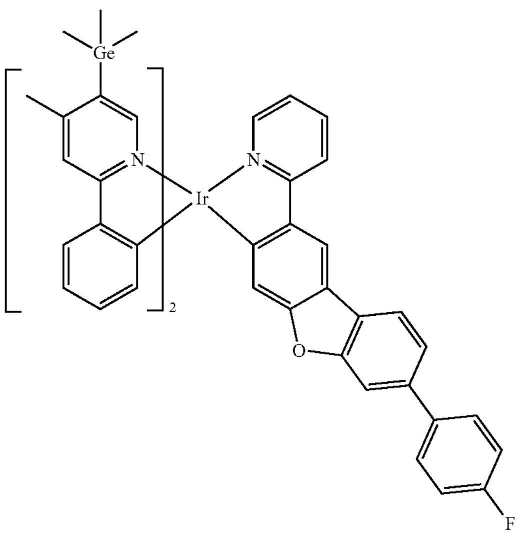
1902
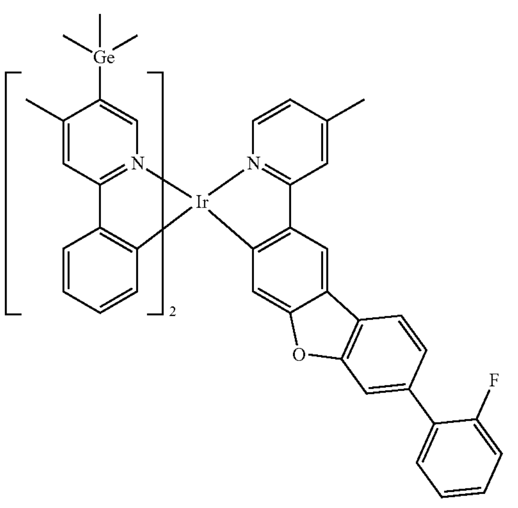
-continued
1903
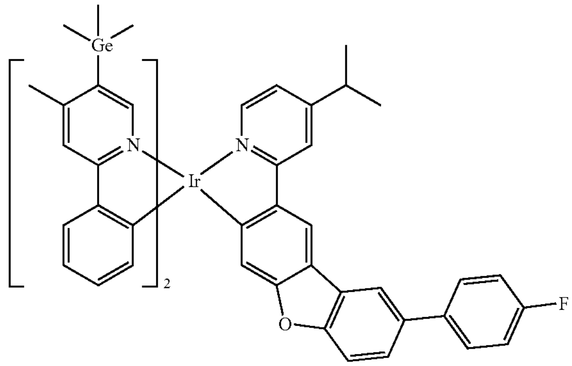
1904
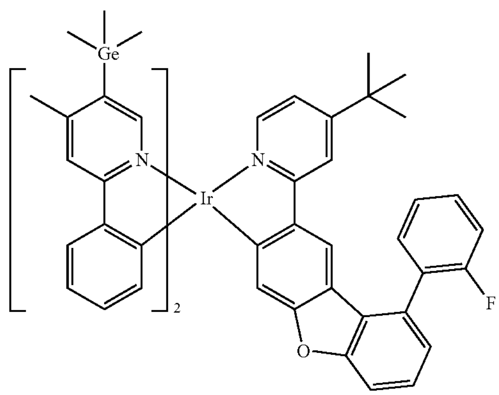
1905
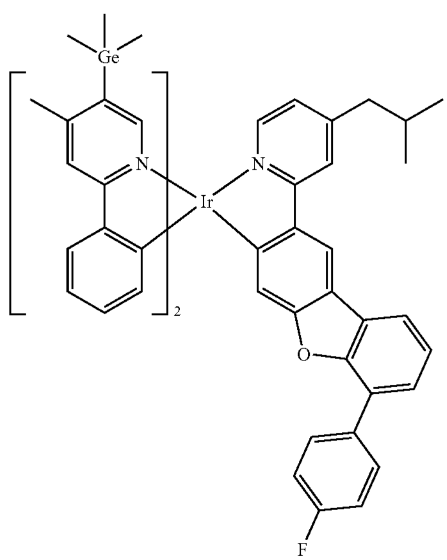

-continued
1906
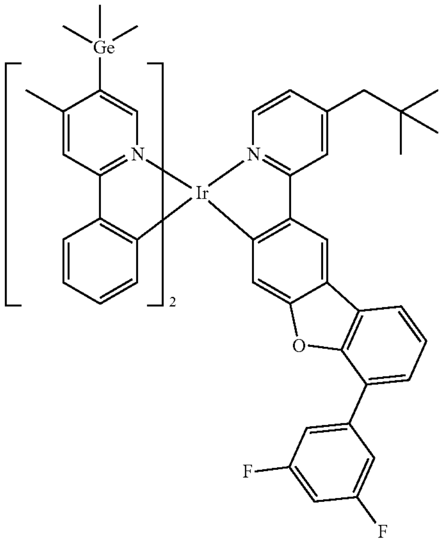
1907
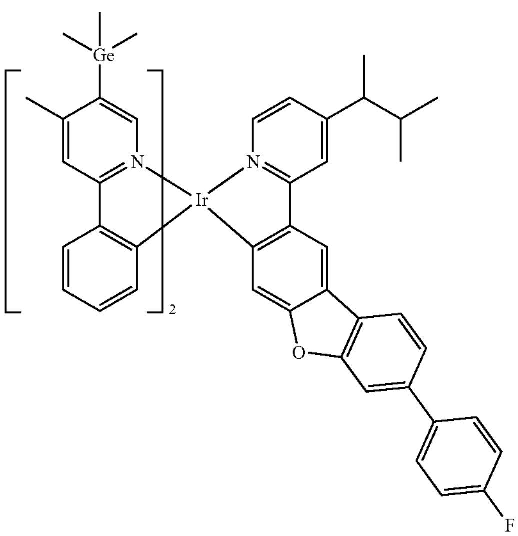
1908
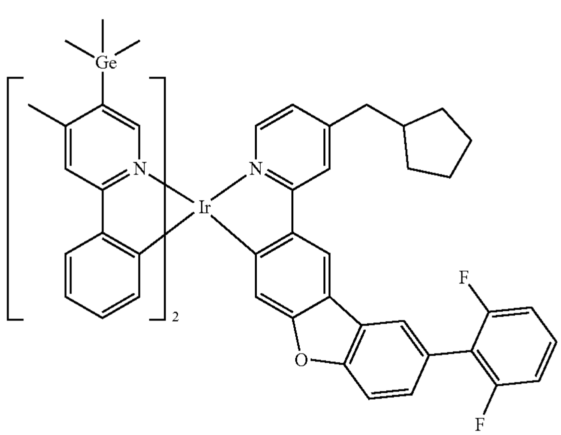
-continued
1909
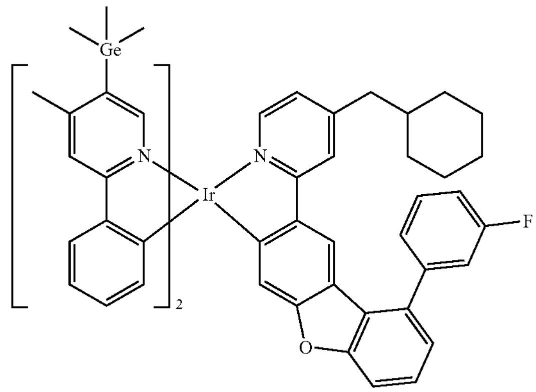
1910
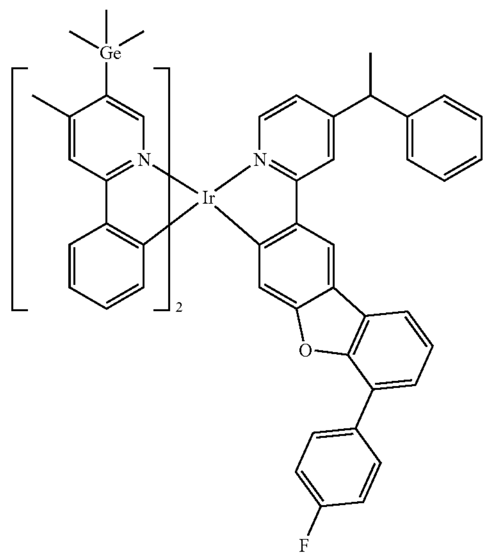
1911
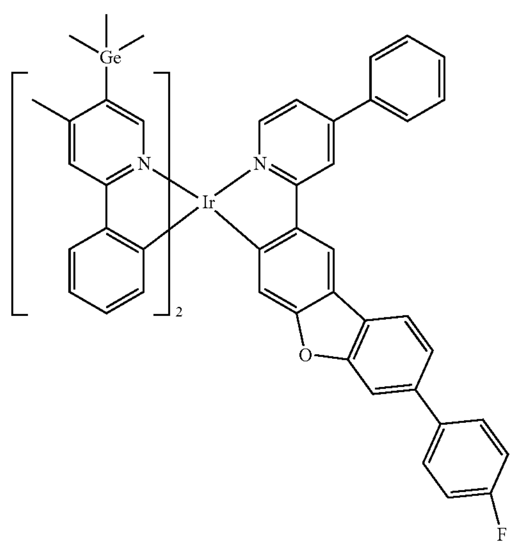

-continued
1912
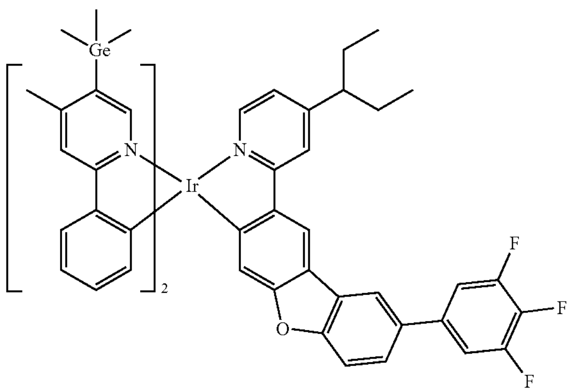
1913
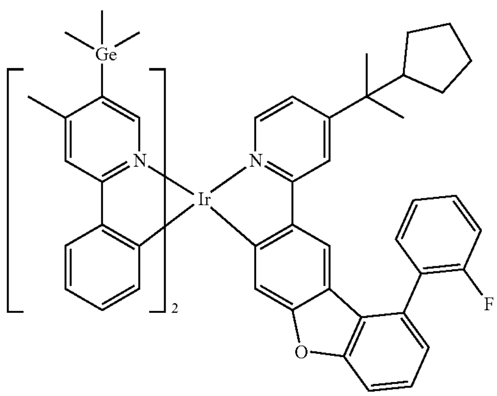
1914
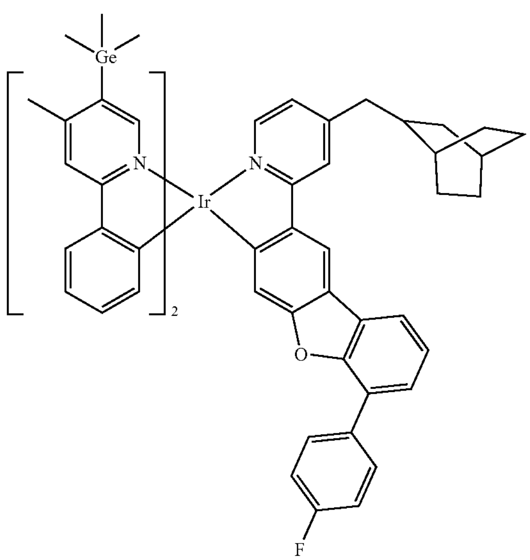
-continued
1915
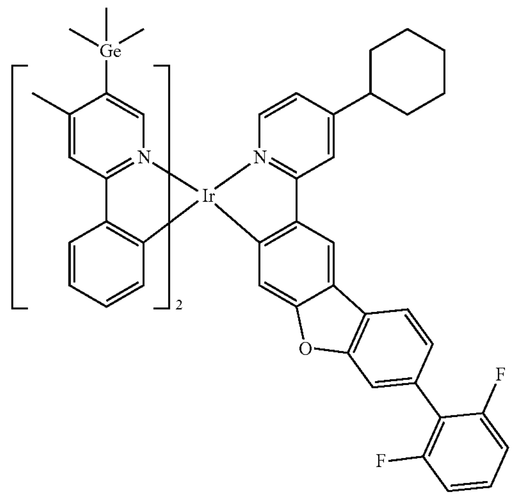
1916
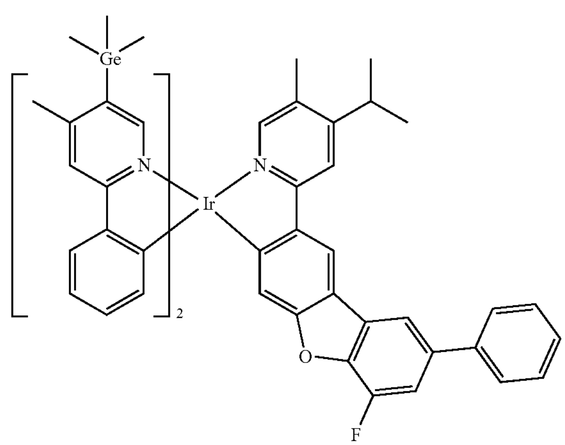
1917
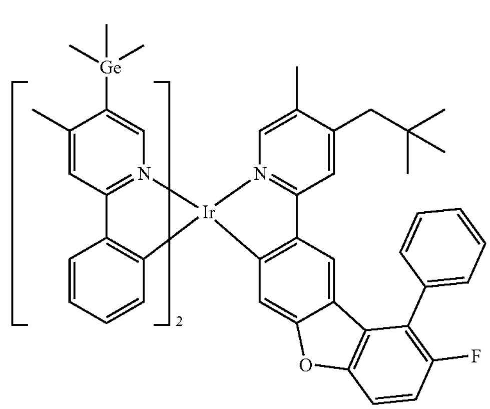

-continued
1918
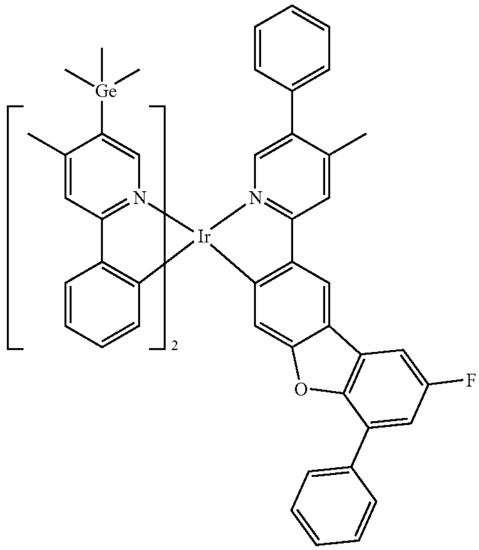
1919
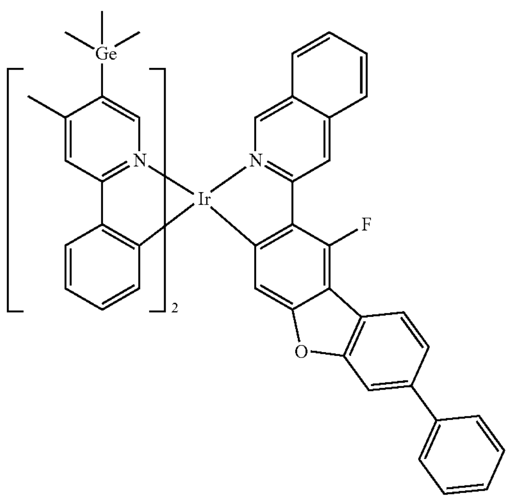
1920
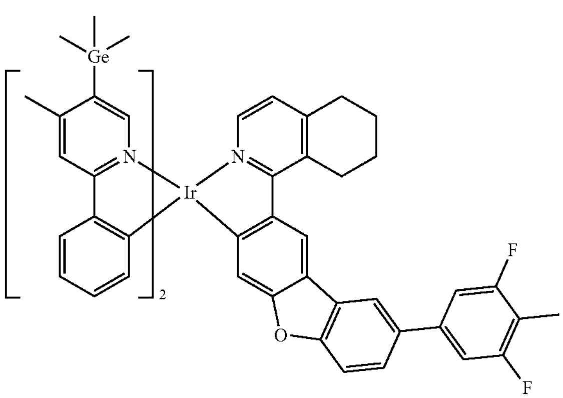
-continued
1921
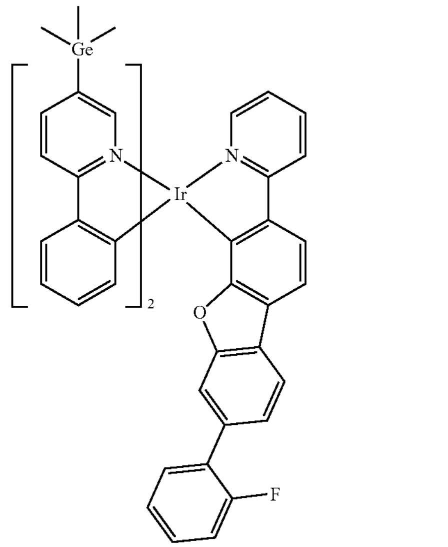
1922
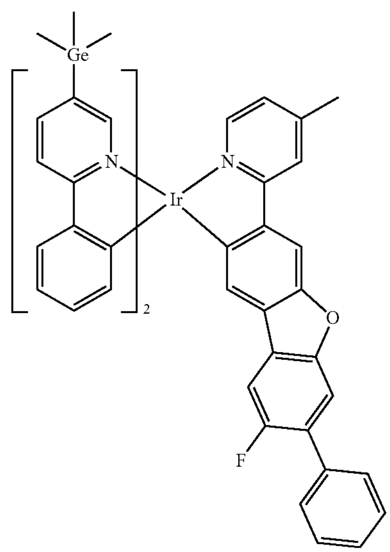
1923
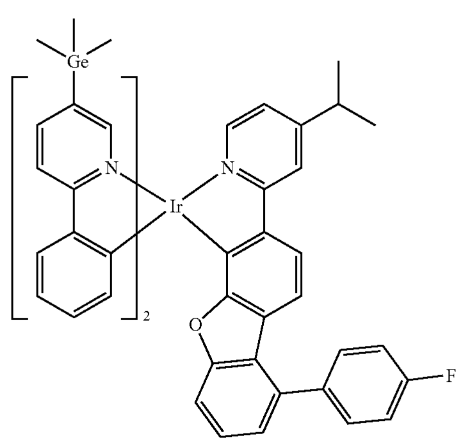

-continued
1924
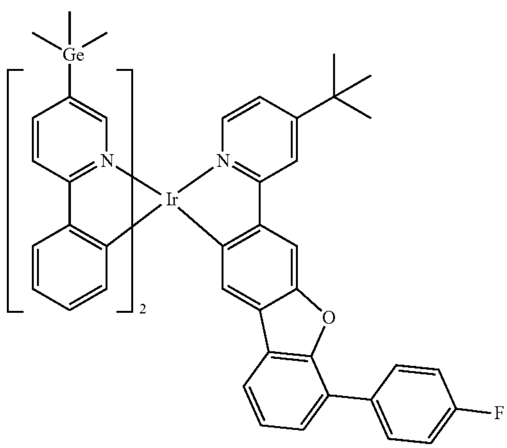
1925
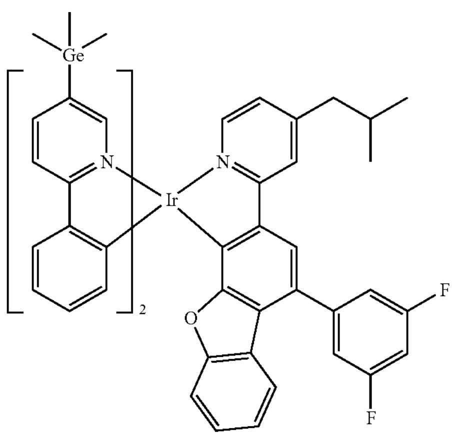
1926
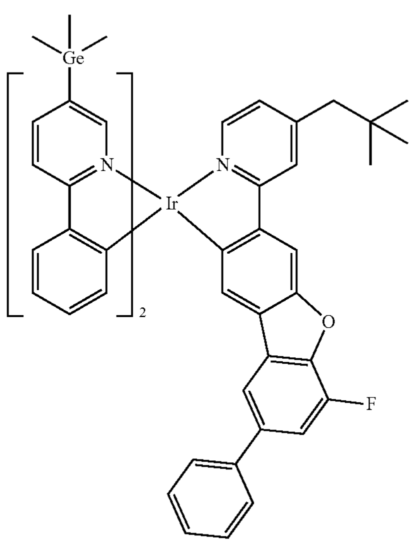
-continued
1927
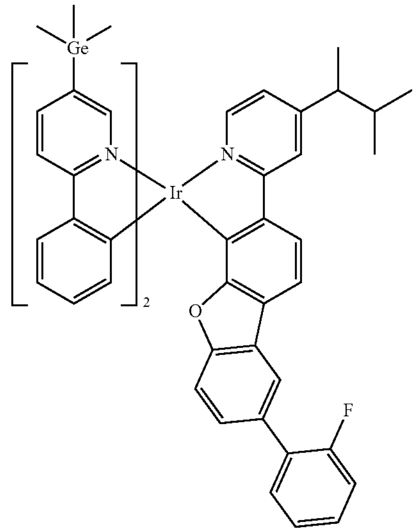
1928
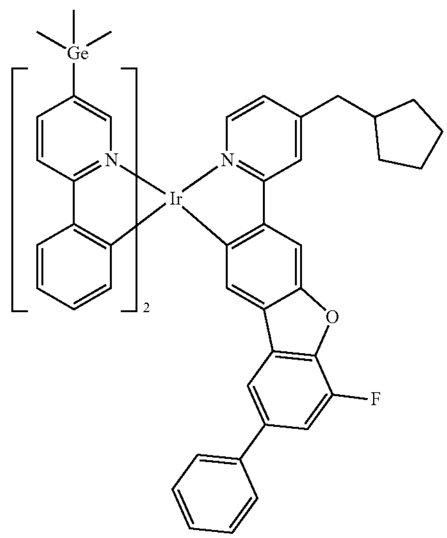
1929
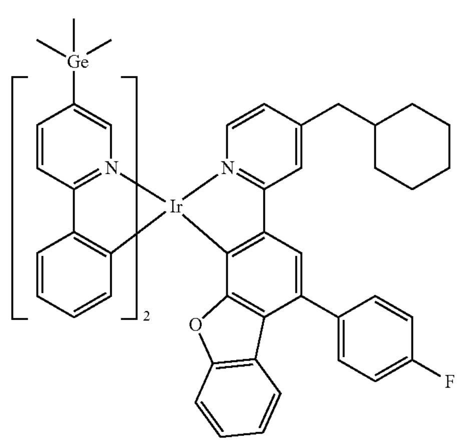

-continued
1930
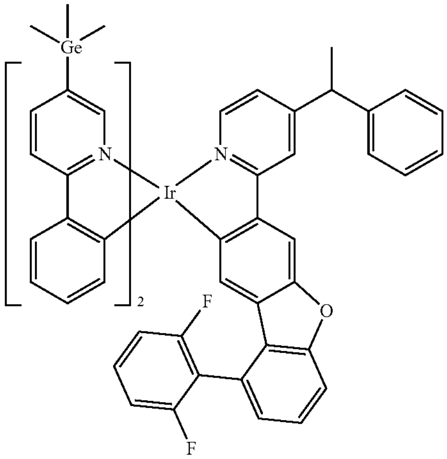
1931
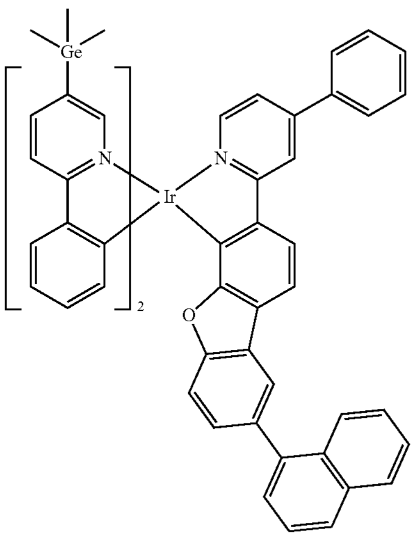
1932
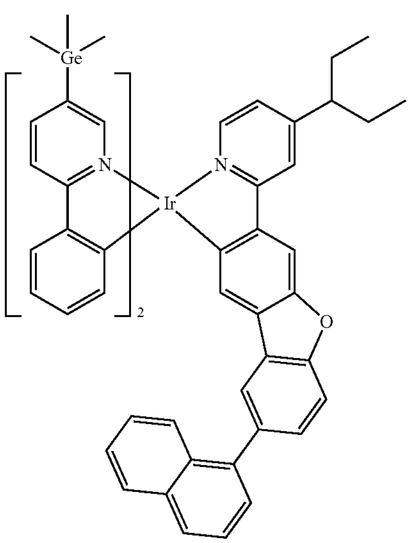
-continued
1933
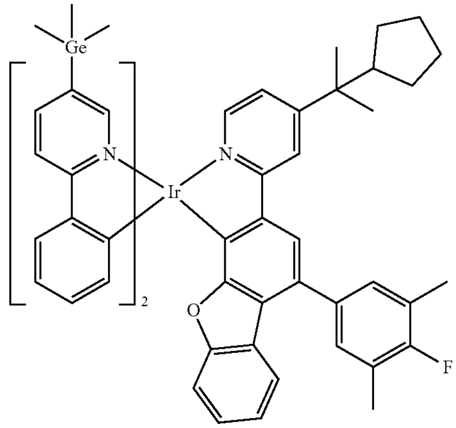
1934
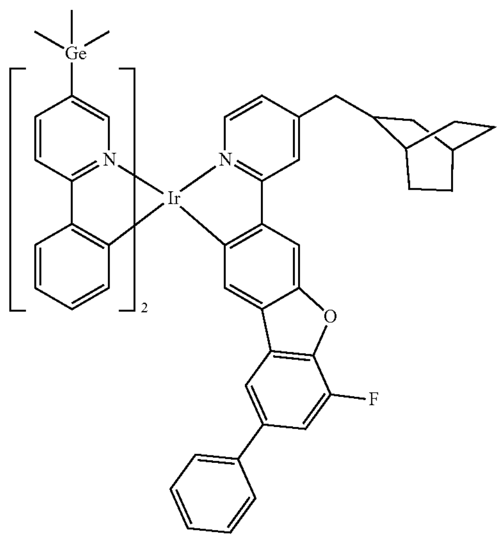
1935
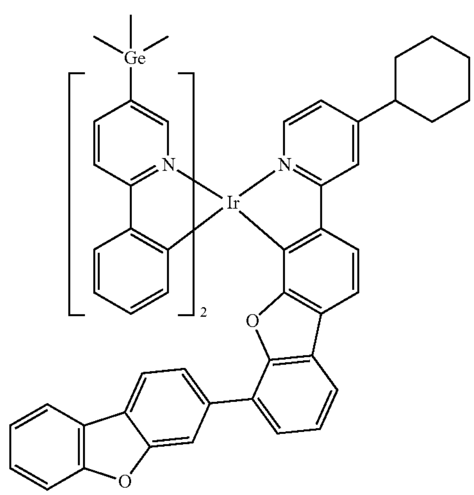

1936
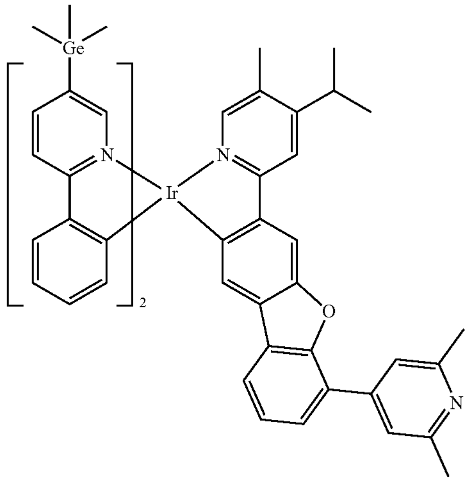
1937
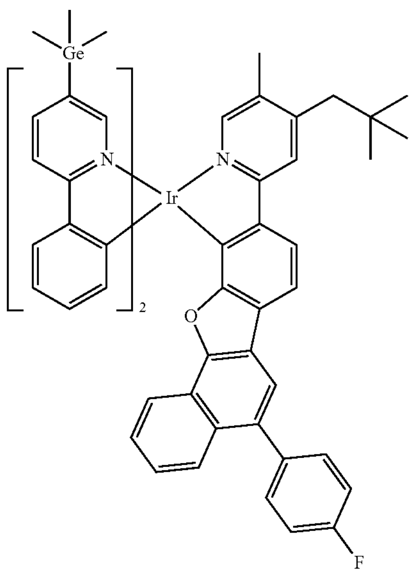
1938
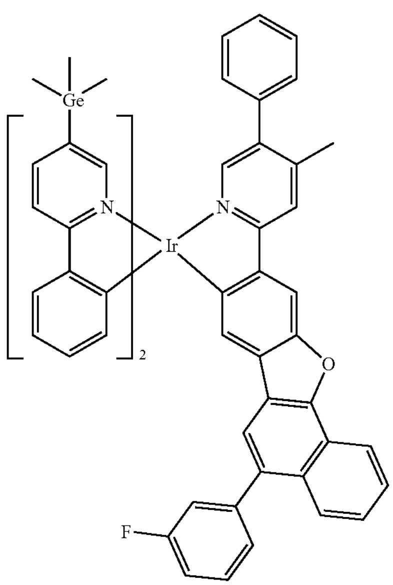
1939
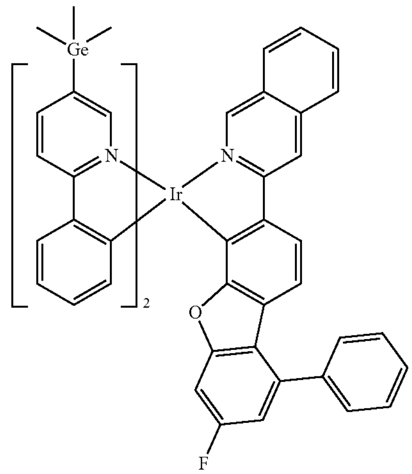
1940
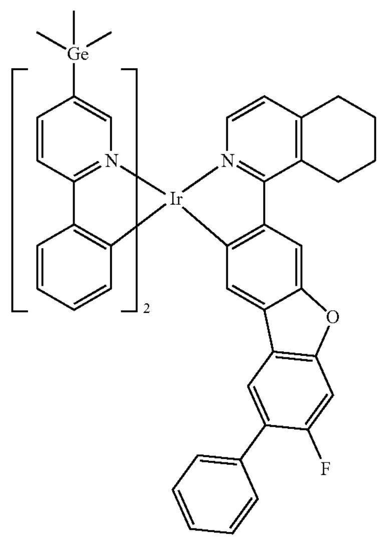
1941
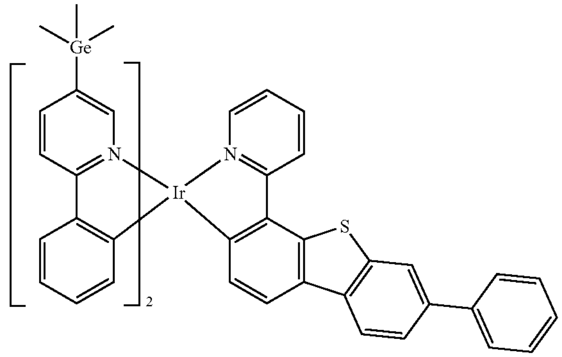

-continued
1942
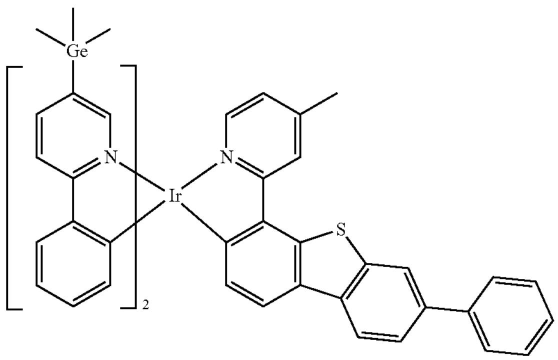
1943
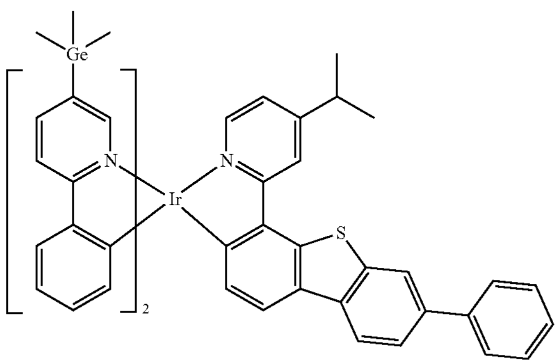
1944
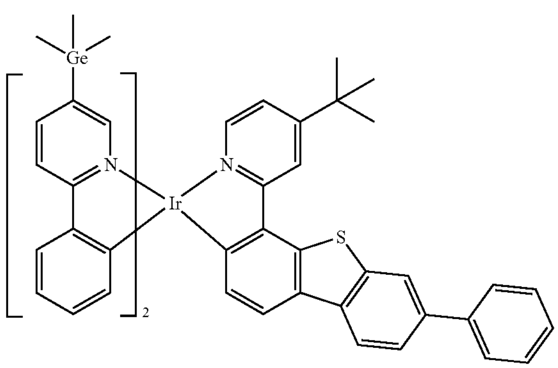
1945
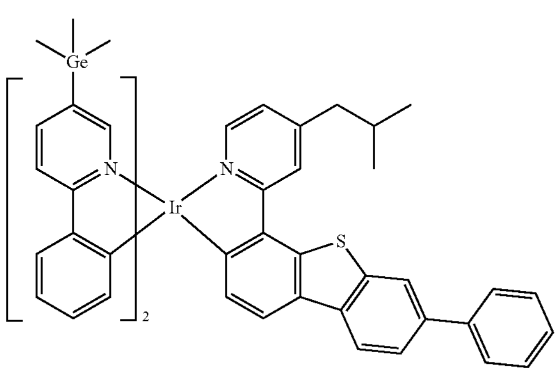
-continued
1946
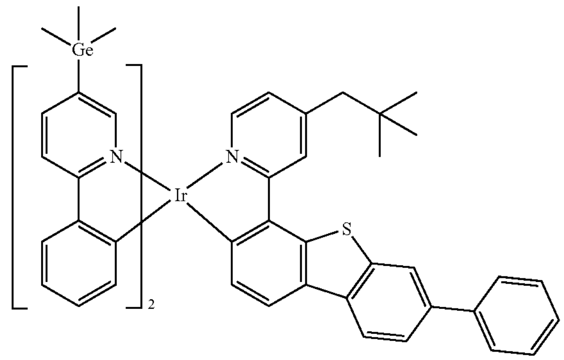
1947
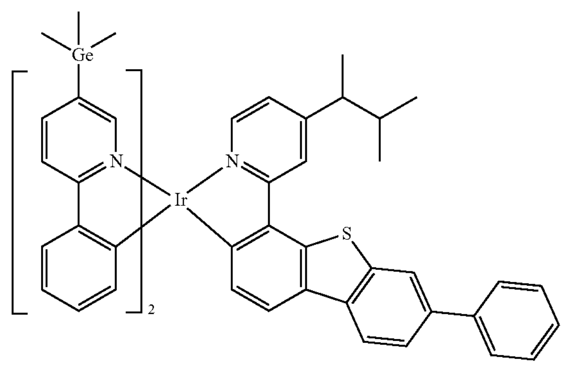
1948
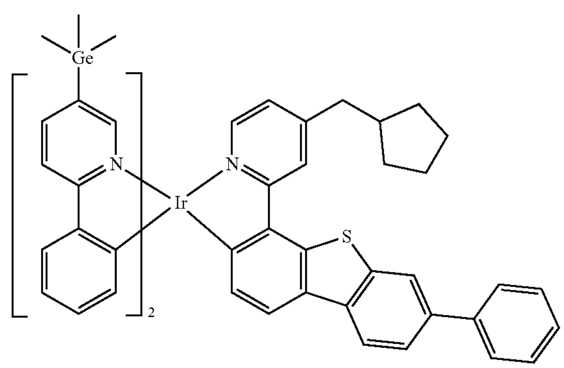
1949
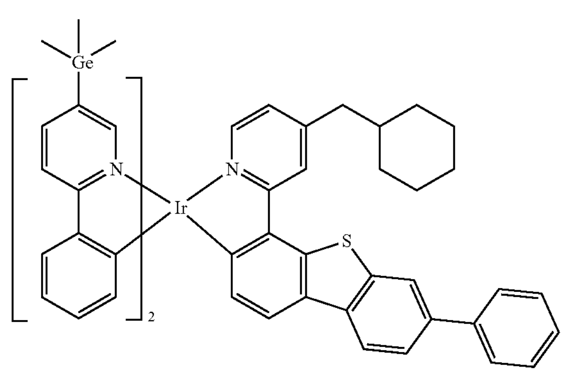

-continued
1950
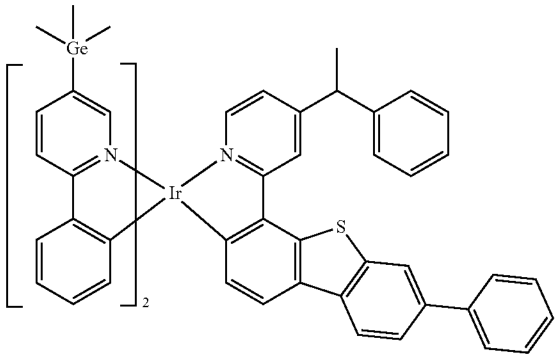
1951
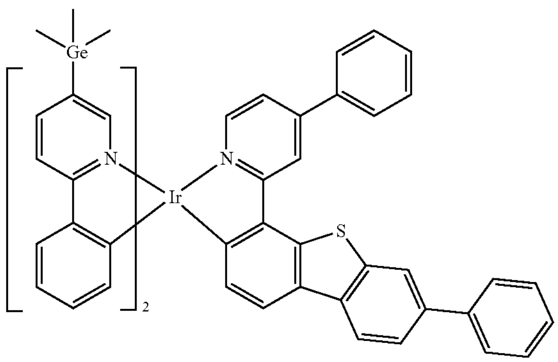
1952
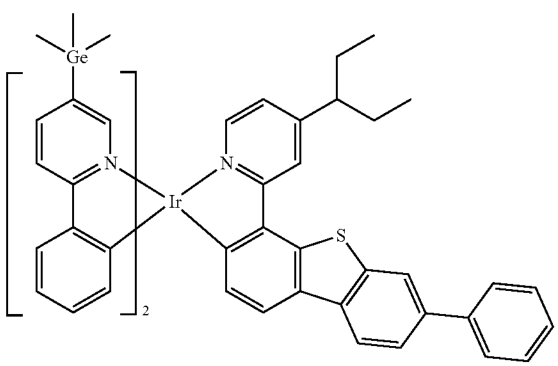
1953
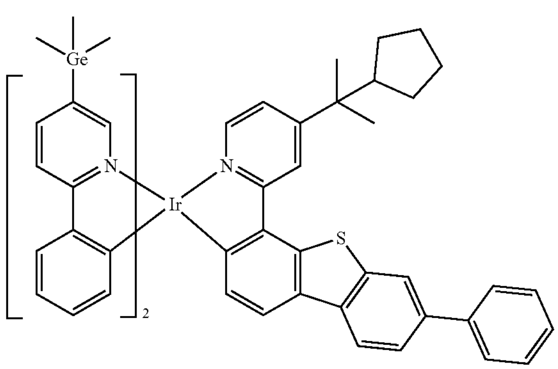
-continued
1954
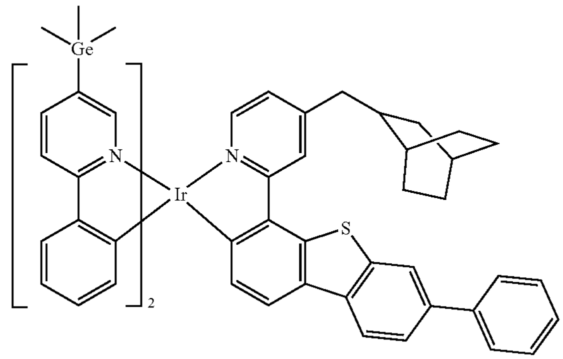
1955
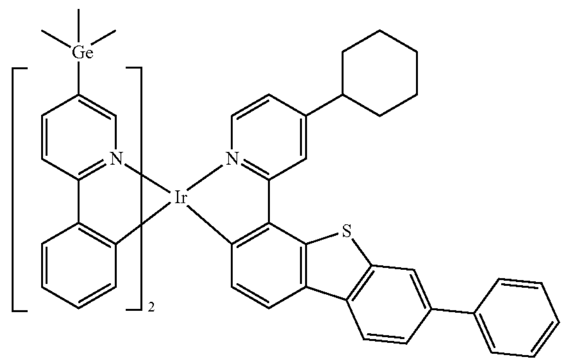
1956
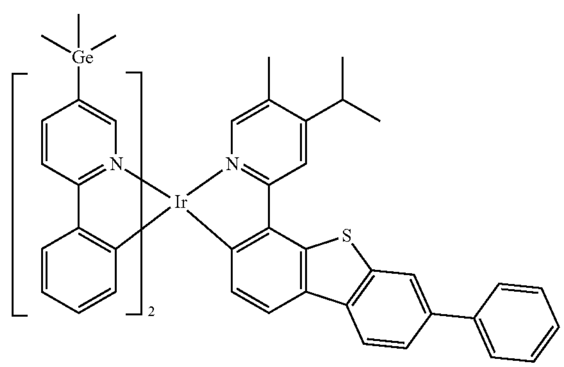
1957
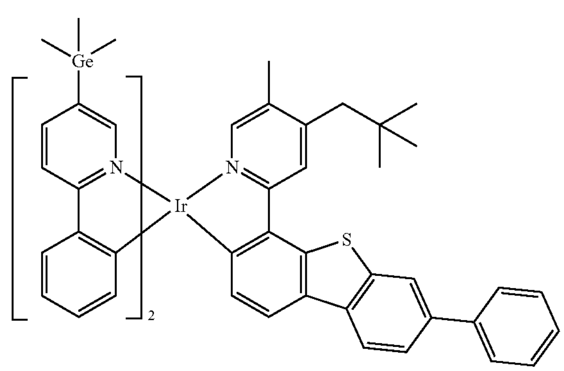

-continued
1958
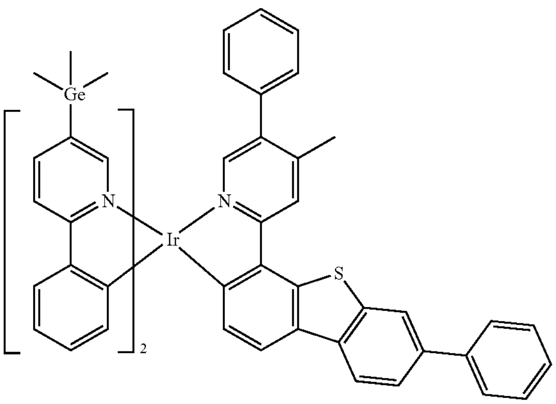
1959
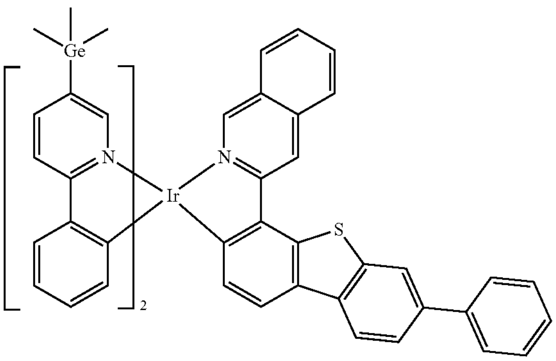
1960
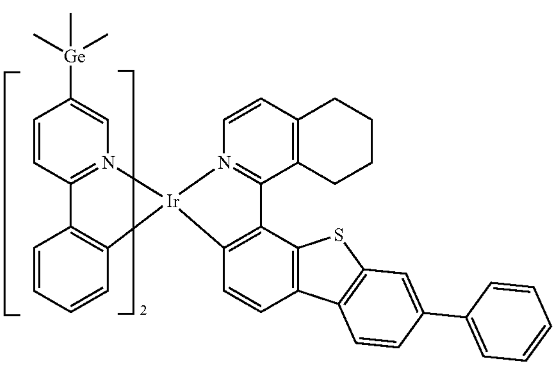
1961
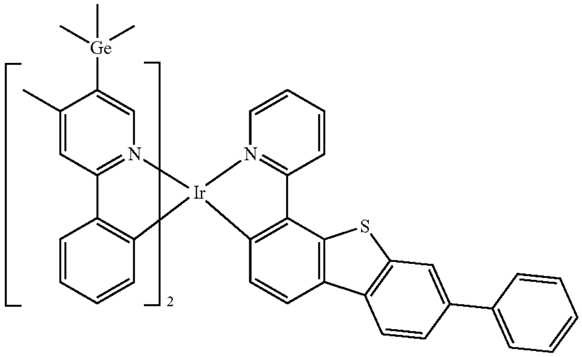
-continued
1962
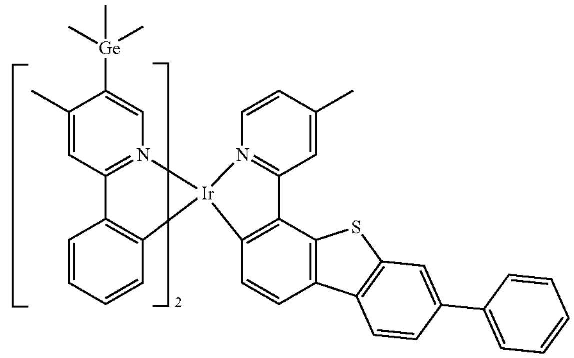
1963
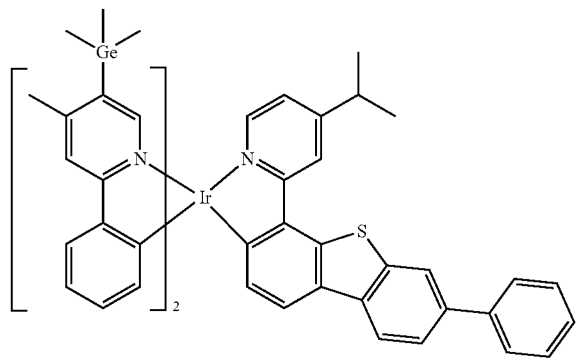
1964
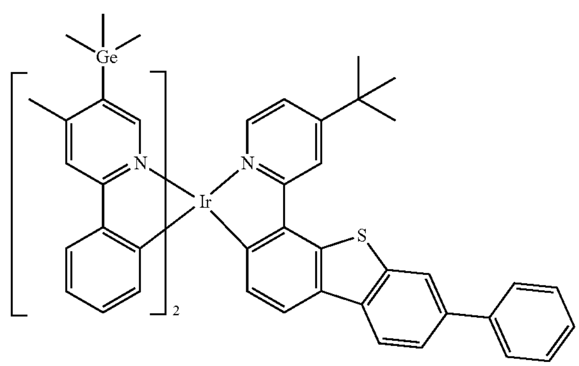
1965
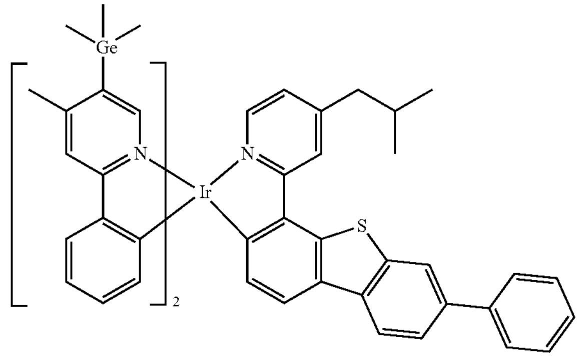

-continued
1966
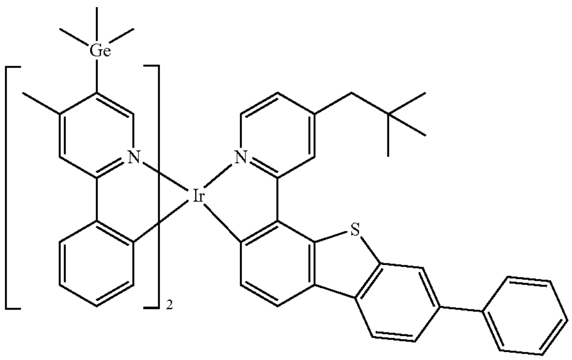
1967
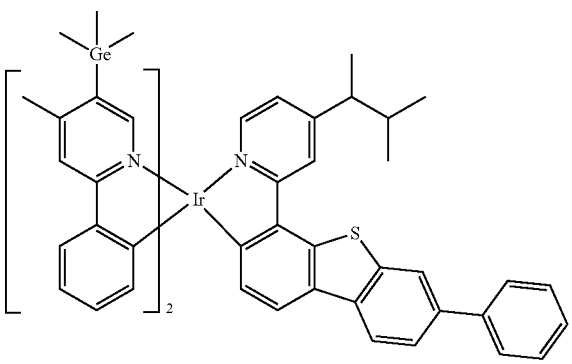
1968
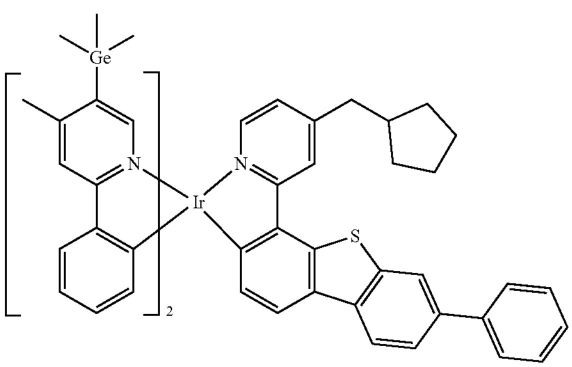
1969
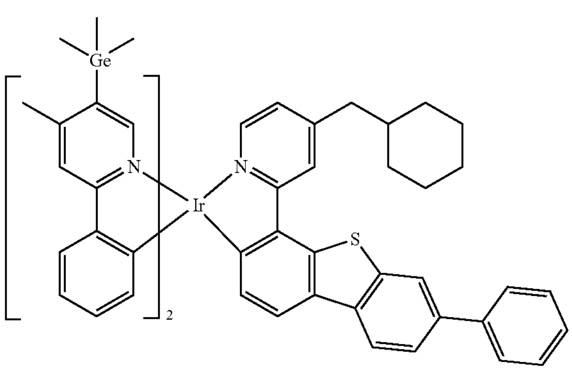
-continued
1970
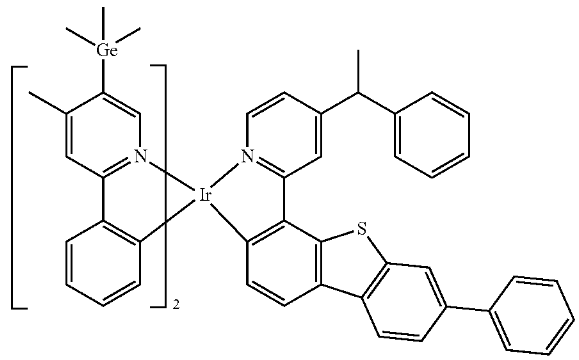
1971
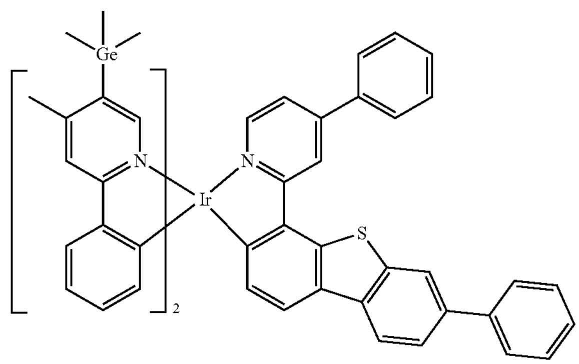
1972
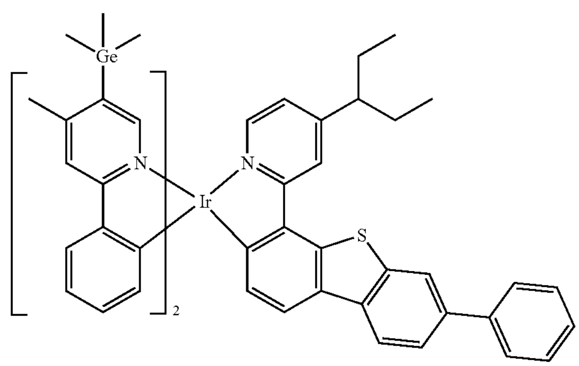
1973
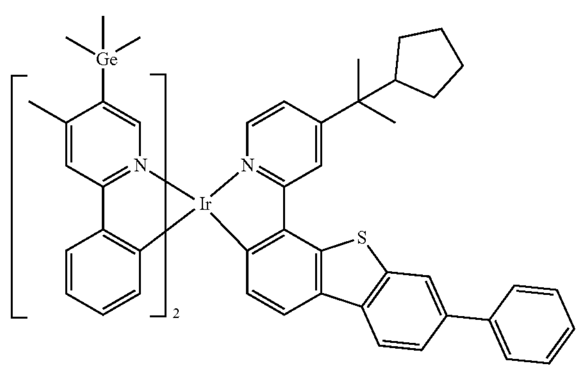

1974
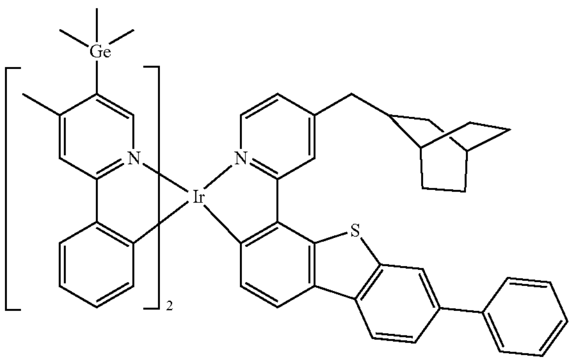
1975
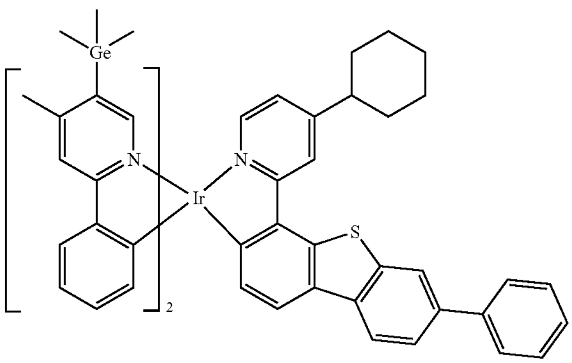
1976
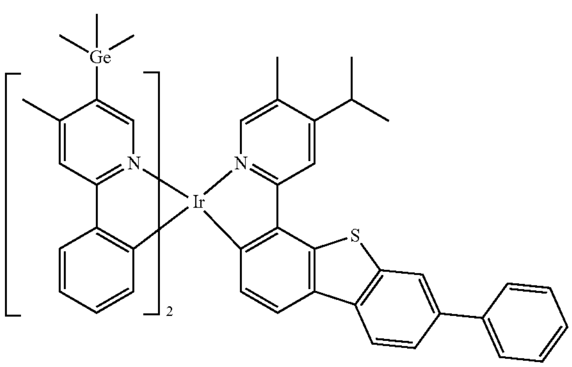
1977
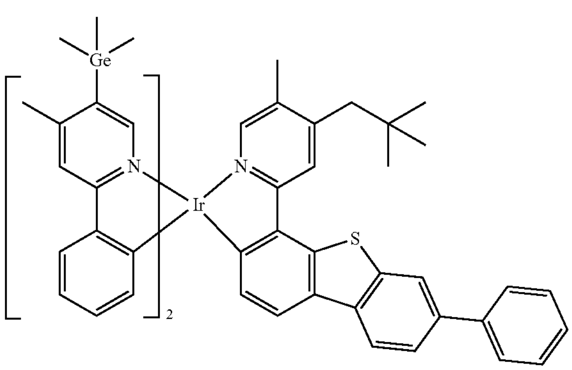
1978
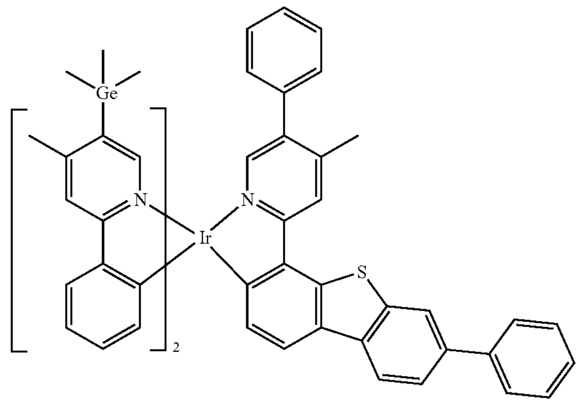
1979
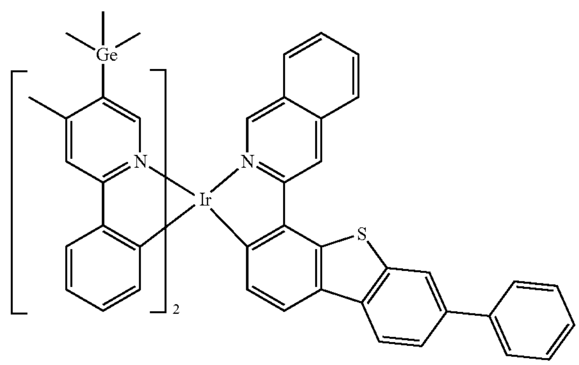
1980
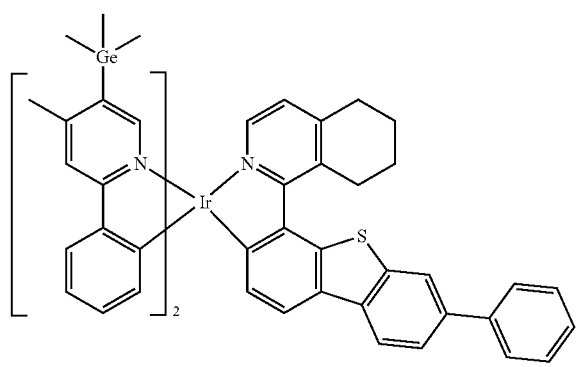
1981
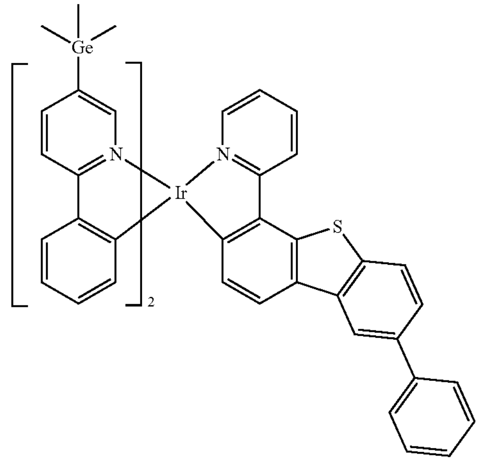

-continued
1982
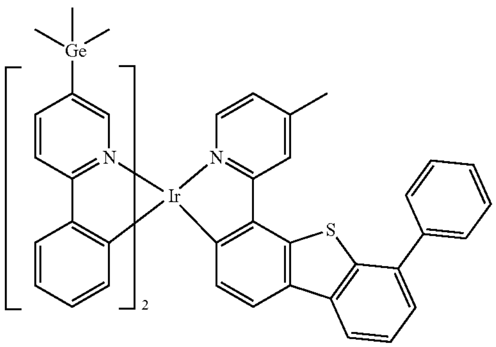
1983
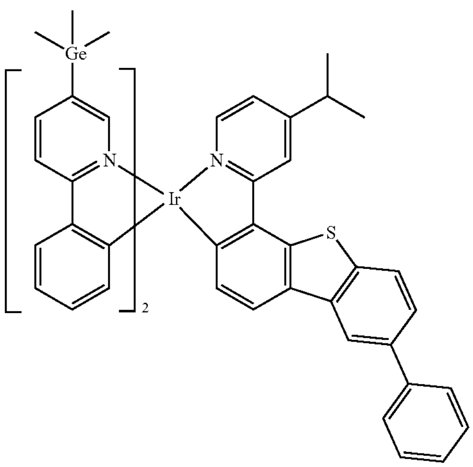
1984
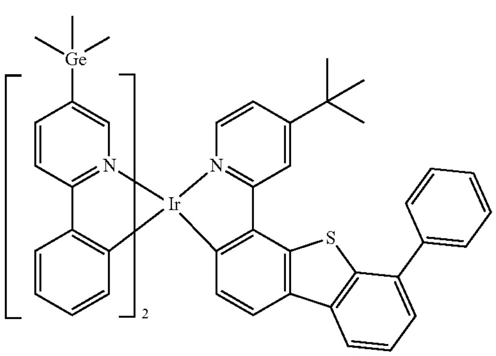
-continued
1985
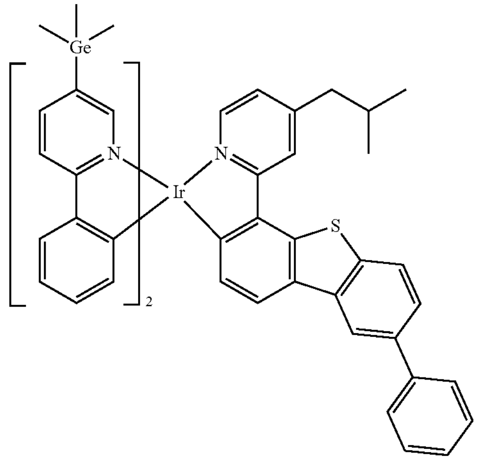
1986
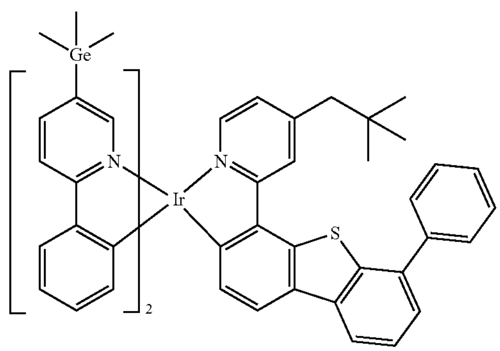
1987
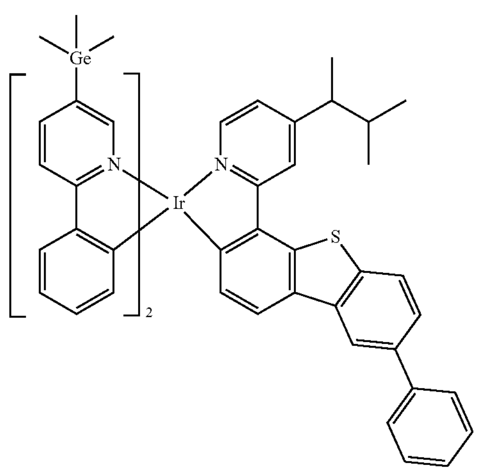

-continued
1988
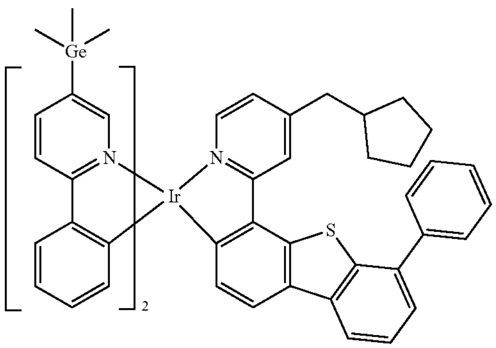
1989
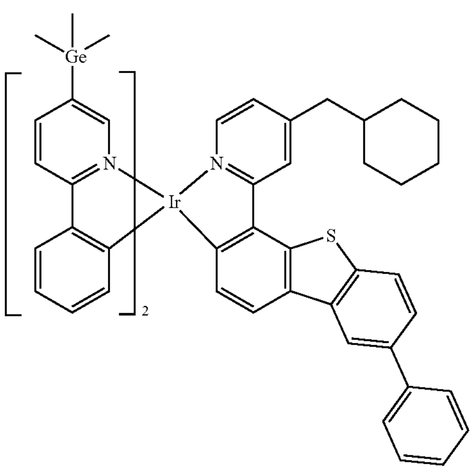
1990
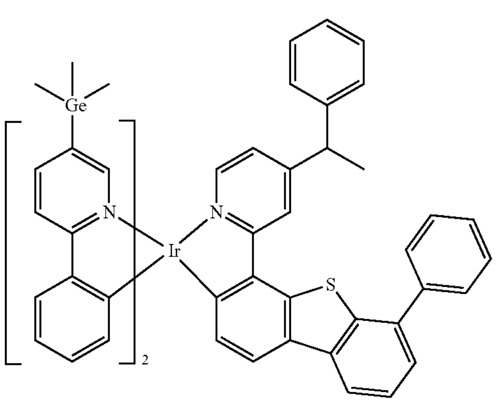
-continued
1991
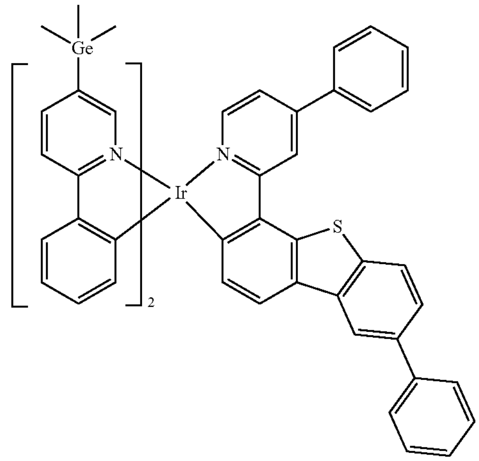
1992
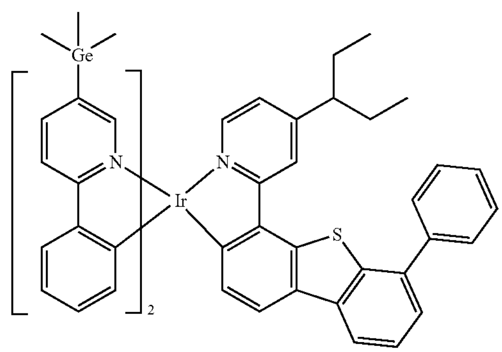
1993
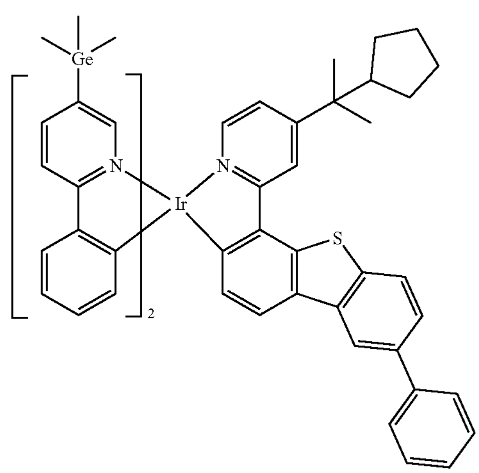

1994
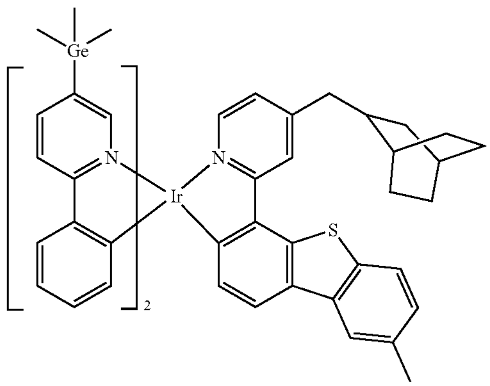
1995
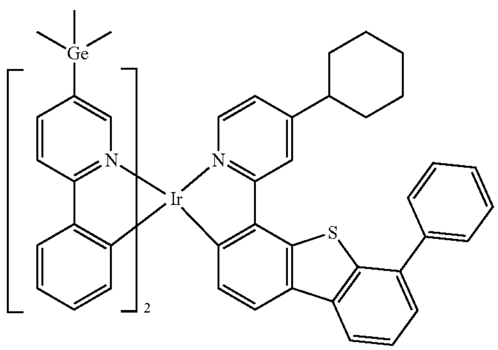
1996
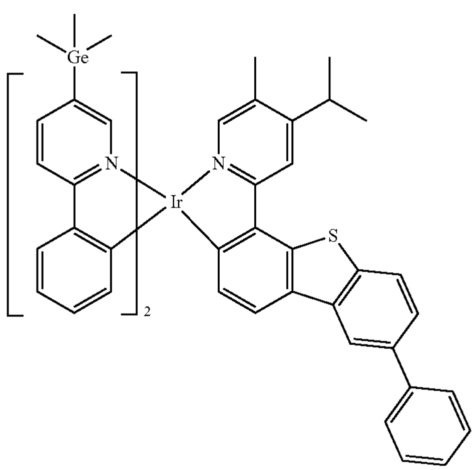
1997
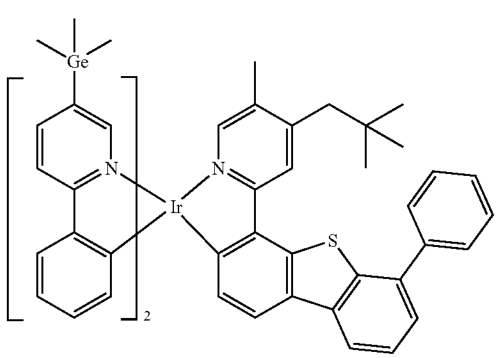
1998
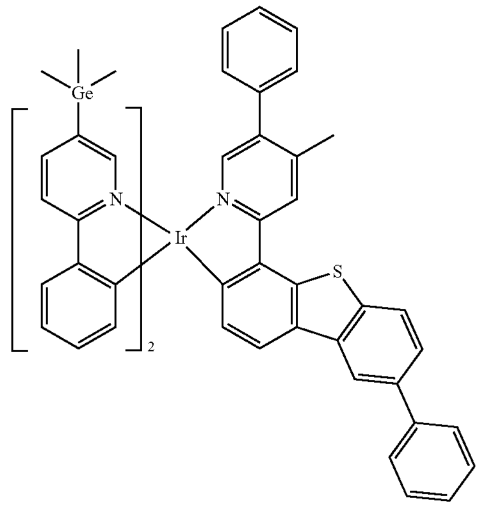
1999
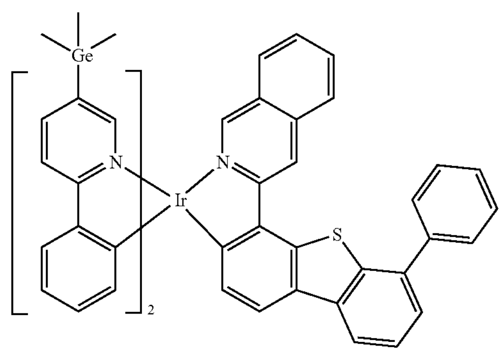
2000
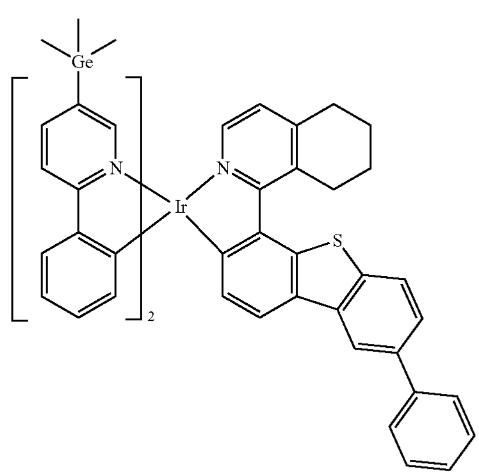

-continued
2001
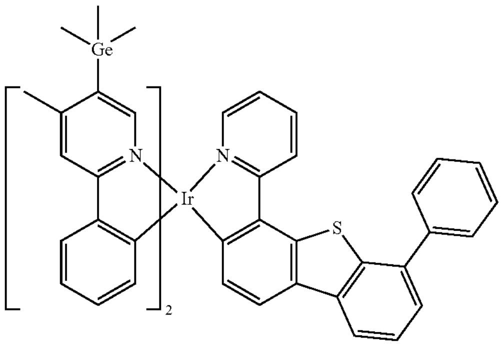
2002
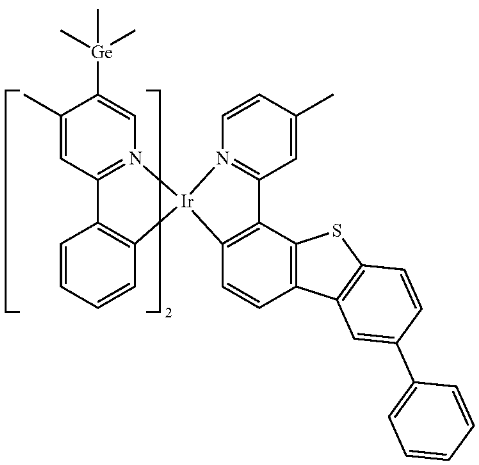
2003
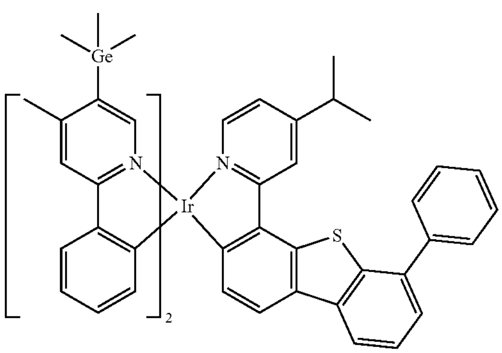
2004
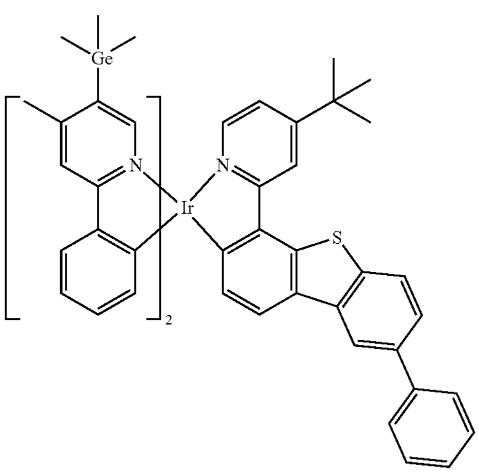
2005
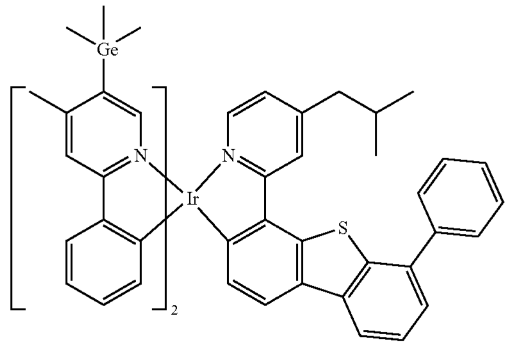
2006
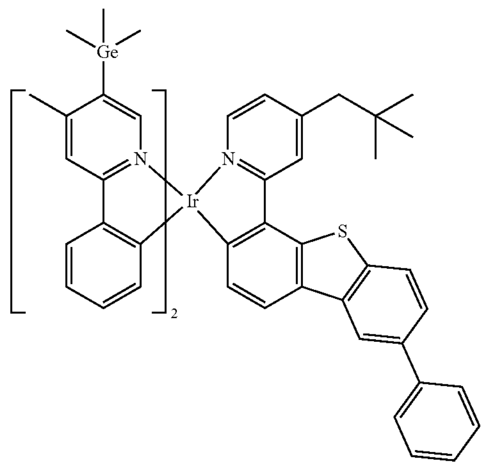
2007
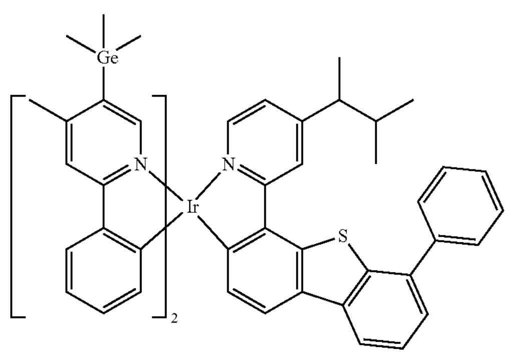
2008
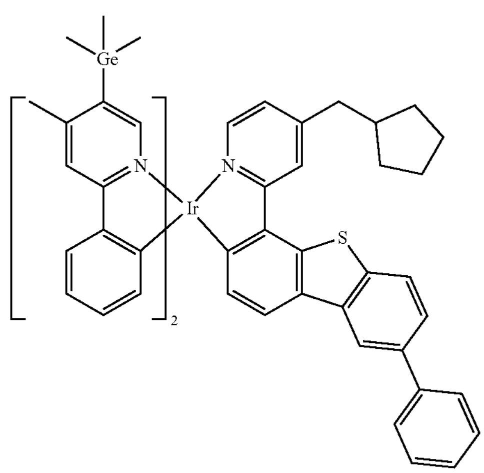

-continued
2009
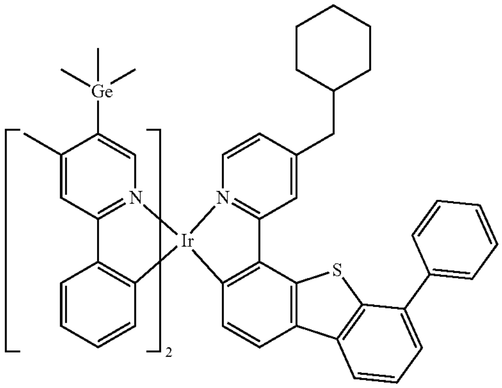
2010
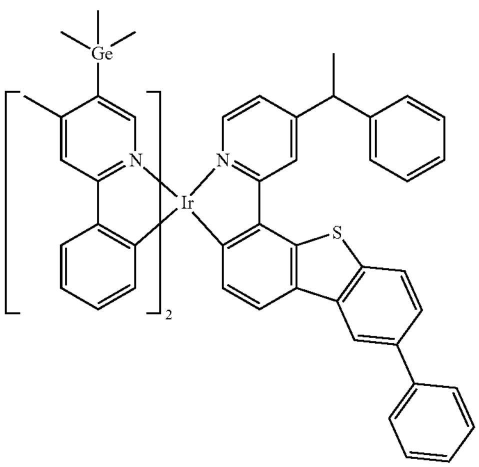
2011
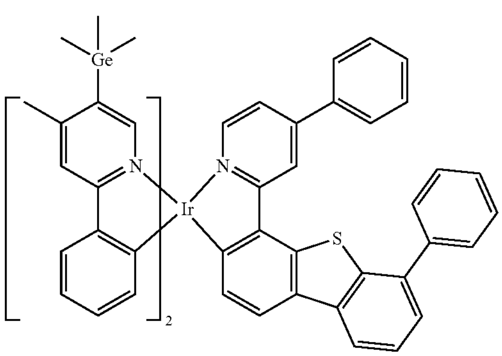
2012
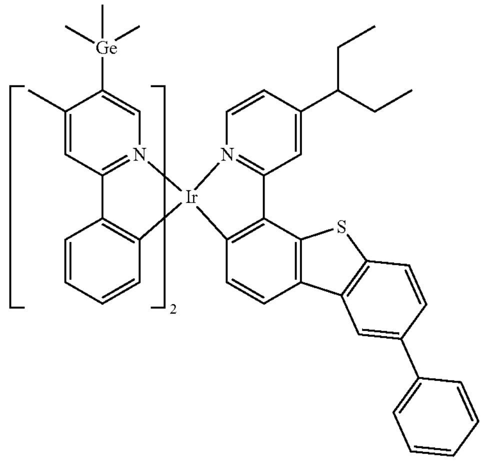
2013
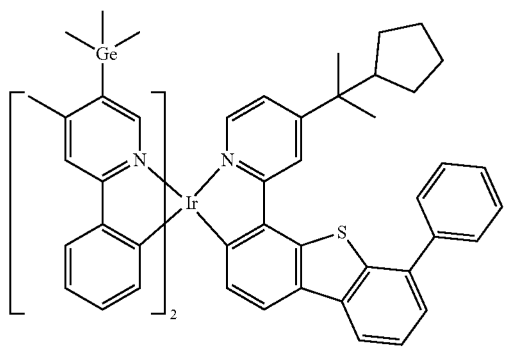
2014
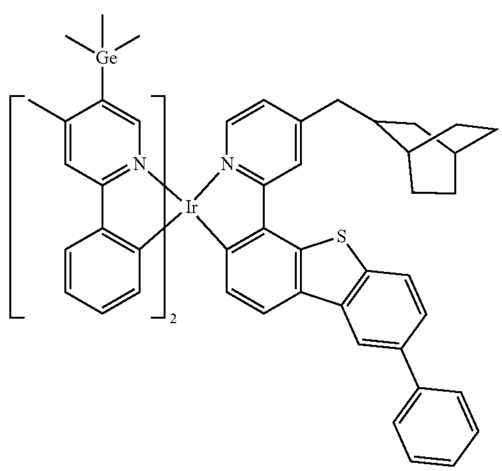

-continued
2015
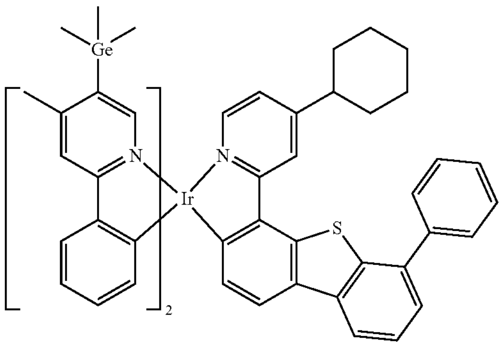
2016
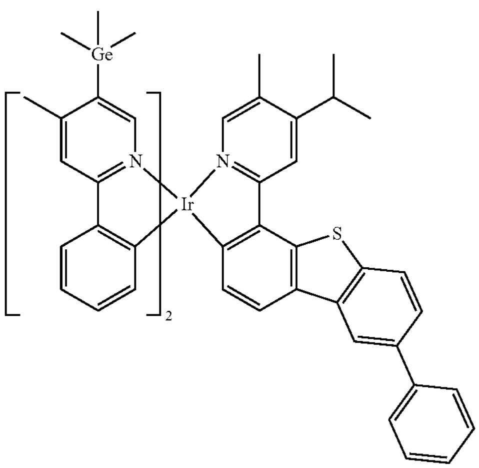
2017
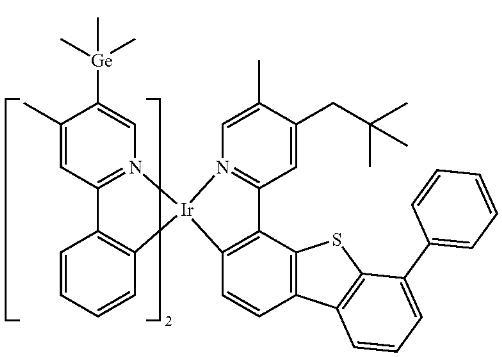
-continued
2018
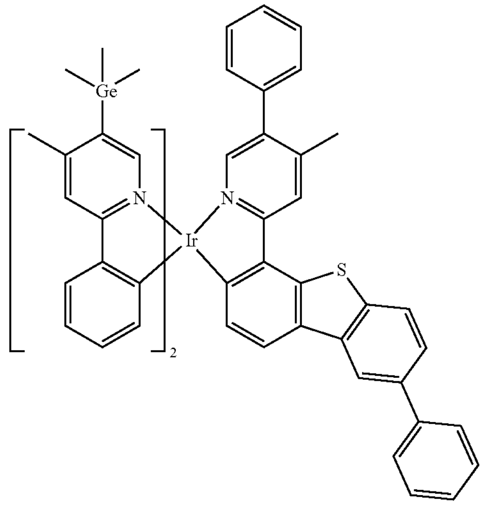
2019
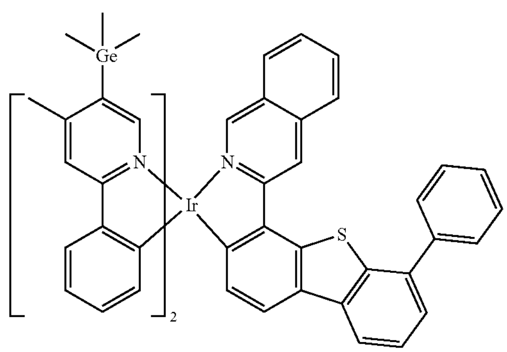
2020
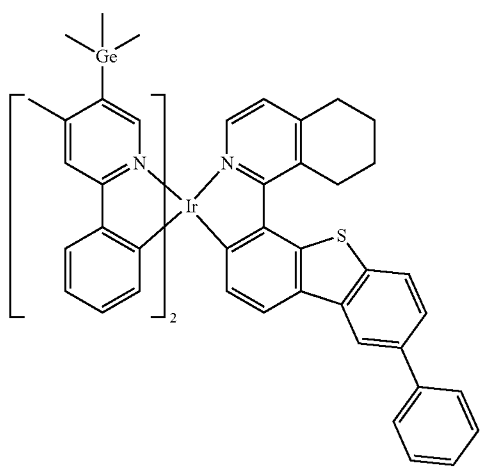

-continued
2021
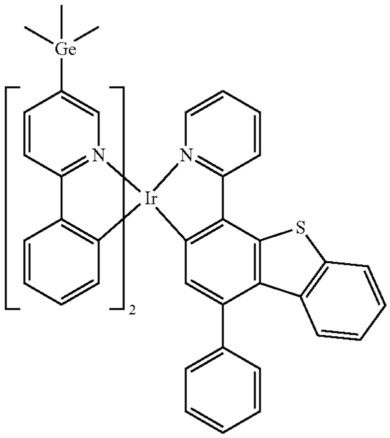
2022
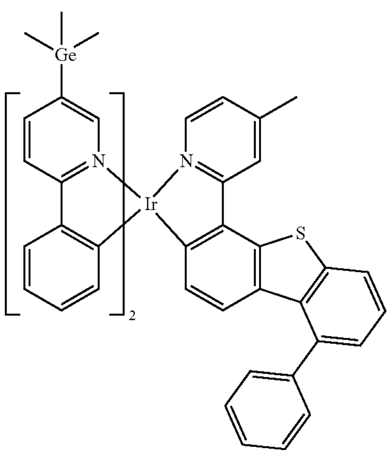
2023
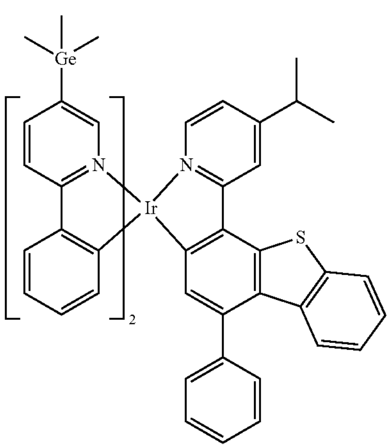
-continued
2024
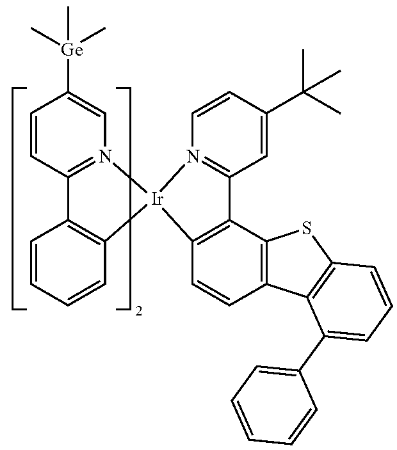
2025
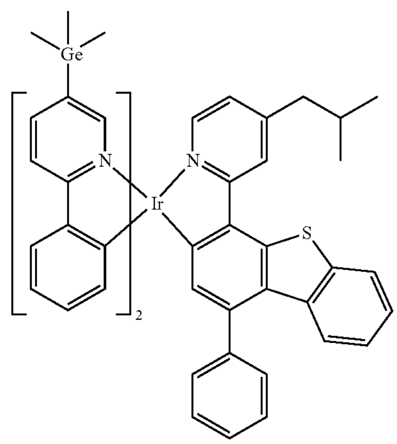
2026
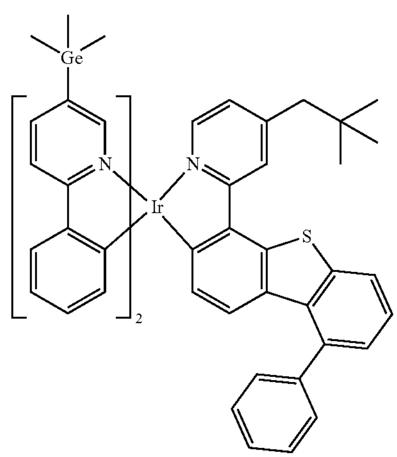

-continued
2027
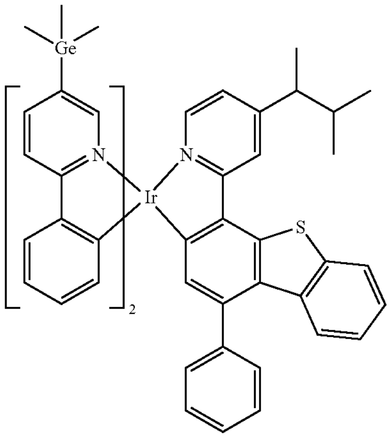
2028
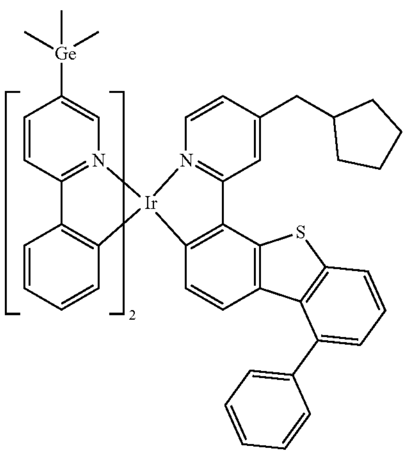
2029
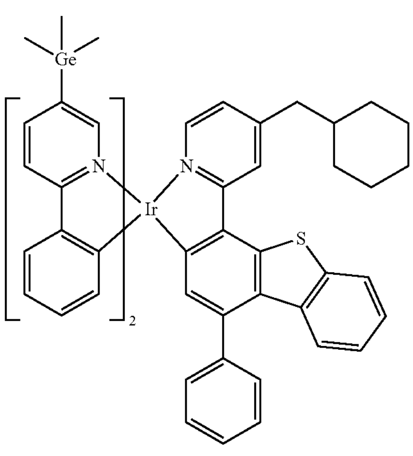
-continued
2030
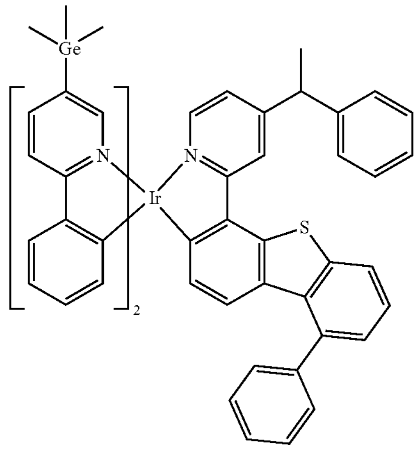
2031
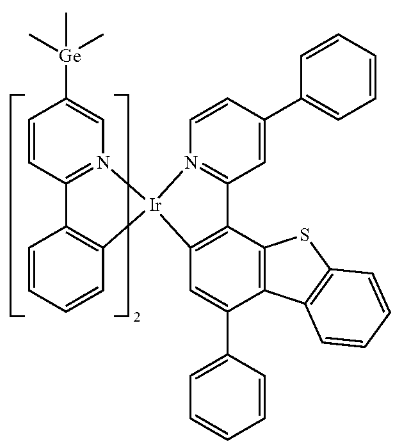
2032
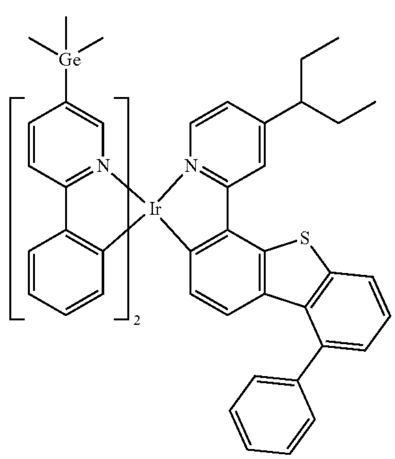

-continued
2033
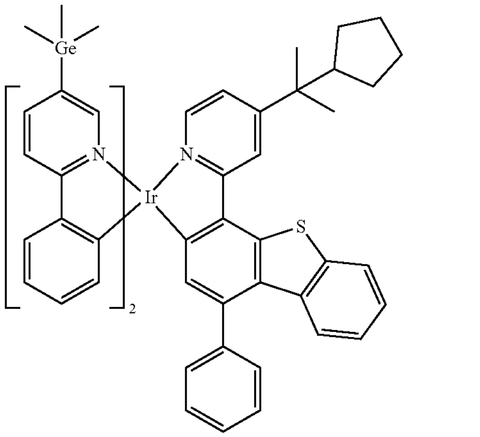
2034
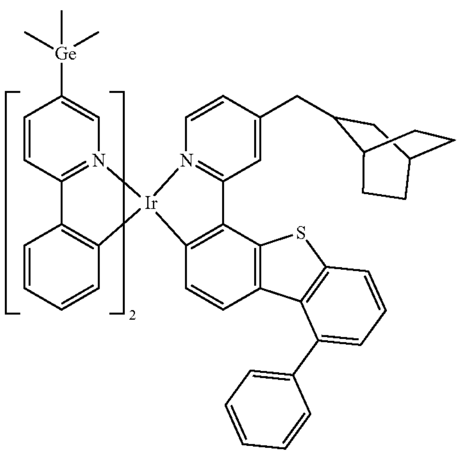
2035
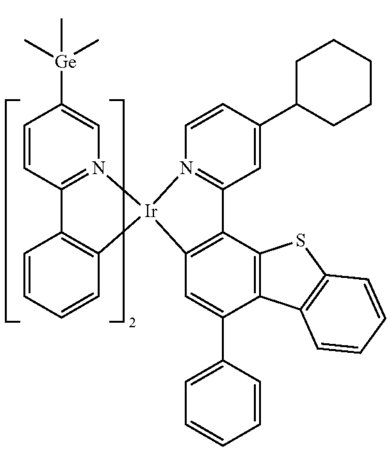
-continued
2036
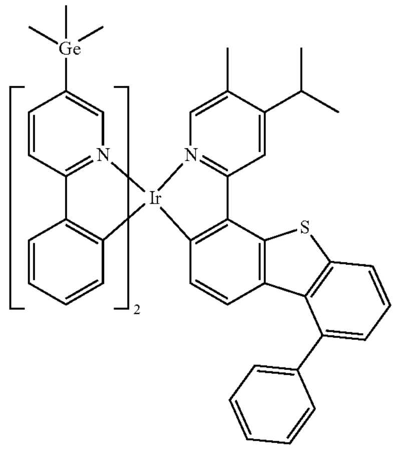
2037
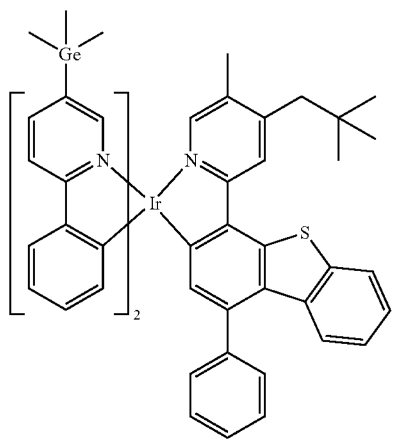
2038
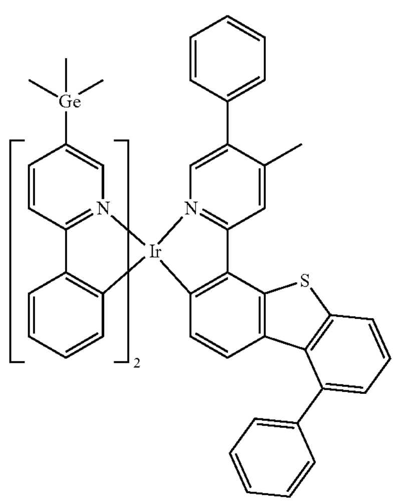

-continued
2039
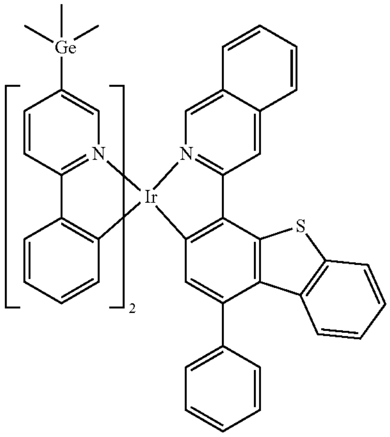
2040
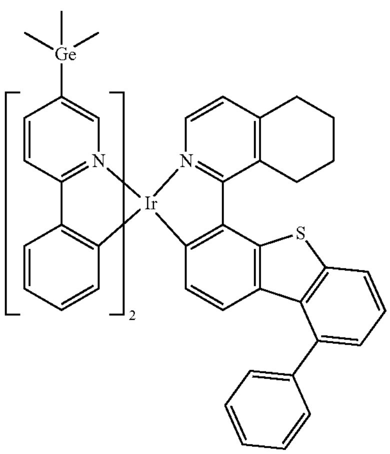
2041
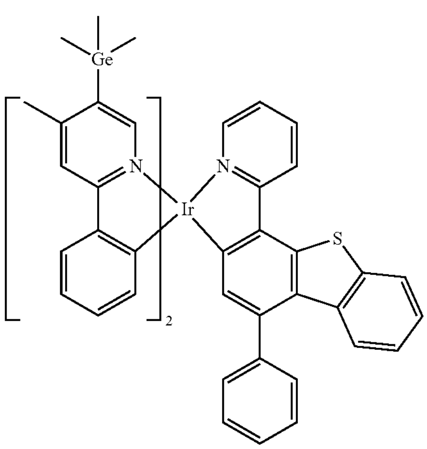
-continued
2042
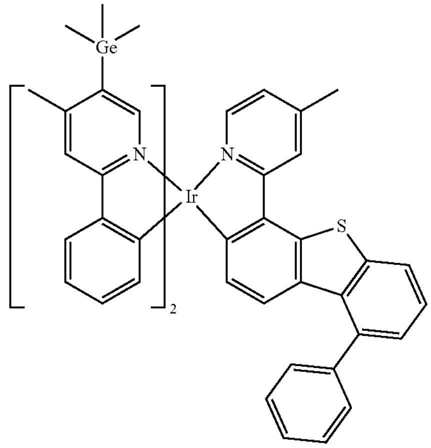
2043
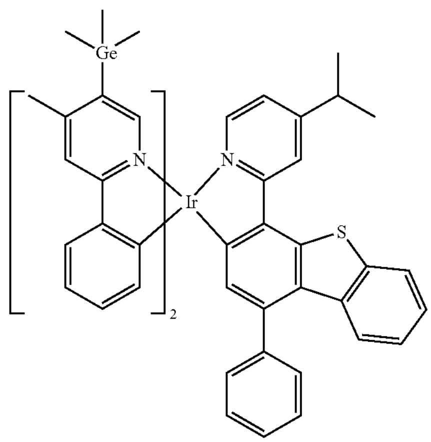
2044
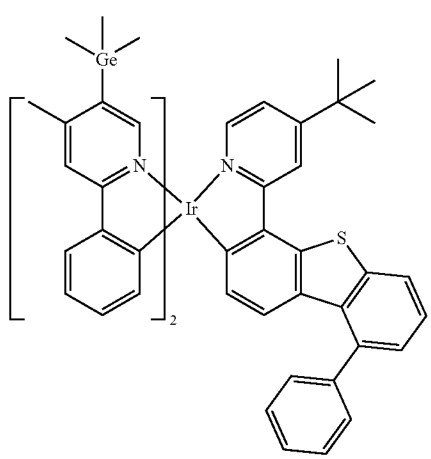

2045
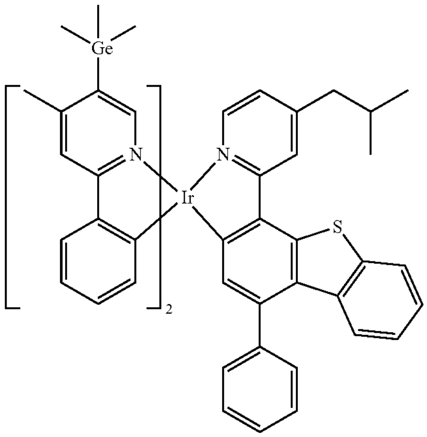
2046
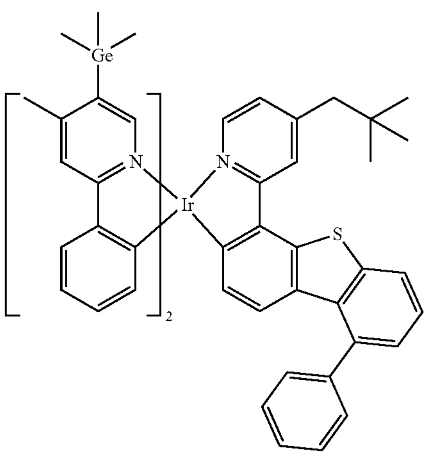
2047
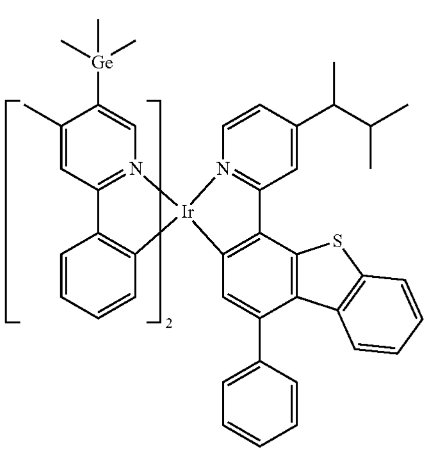
2048
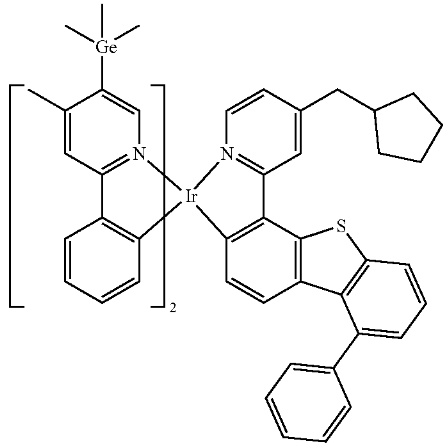
2049
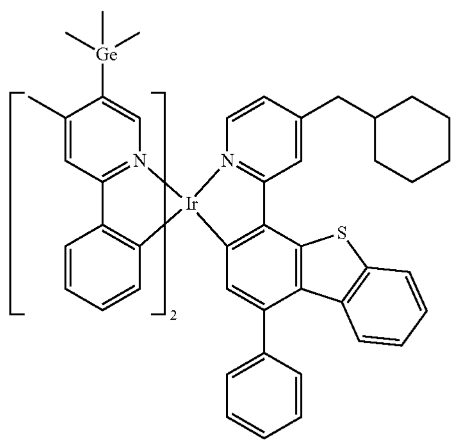
2050
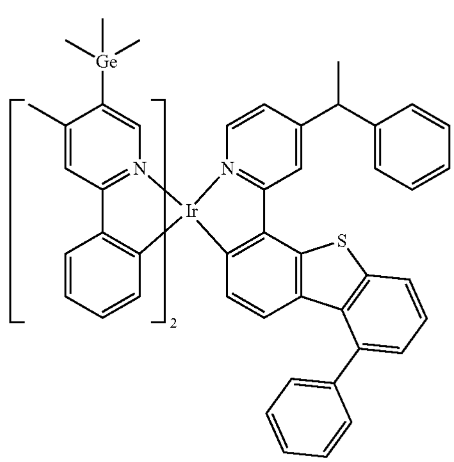

-continued
2051
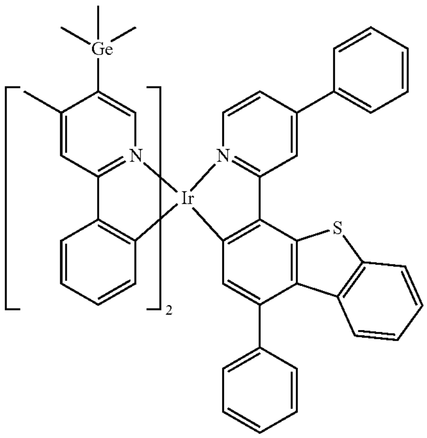
2052
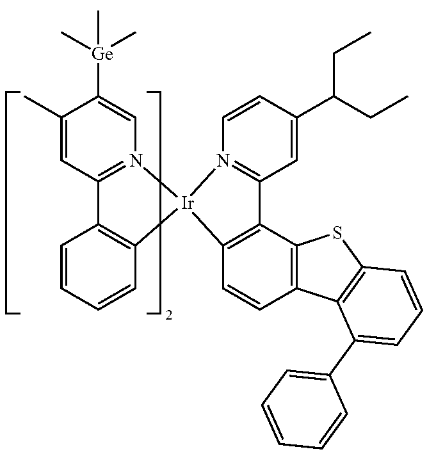
2053
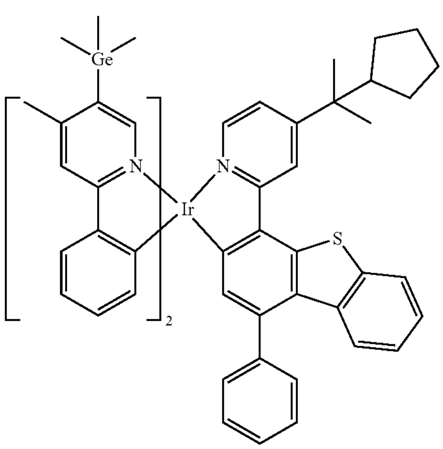
-continued
2054
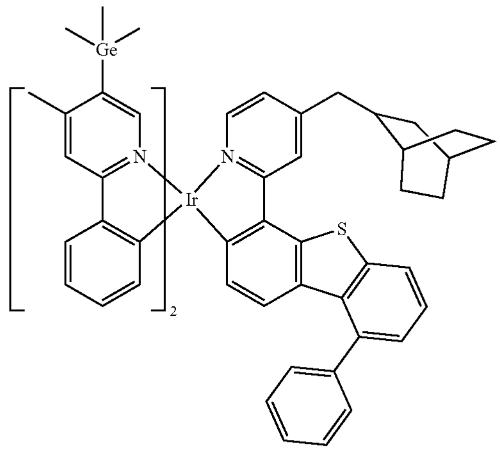
2055
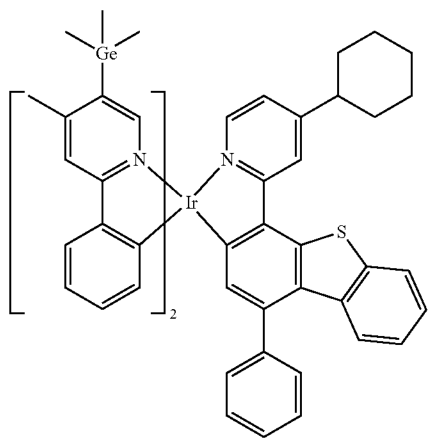
2056
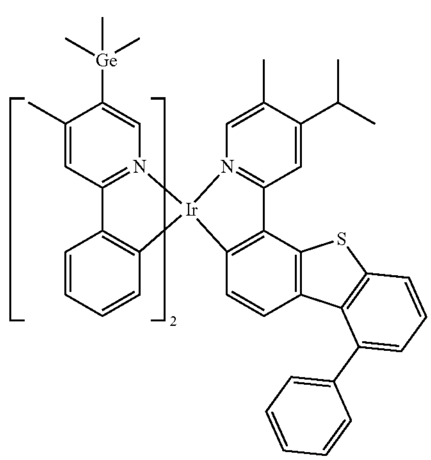

2057
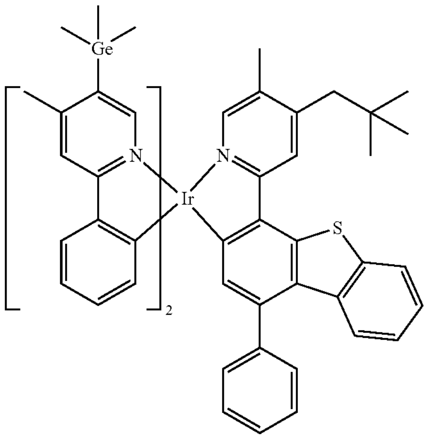
2058
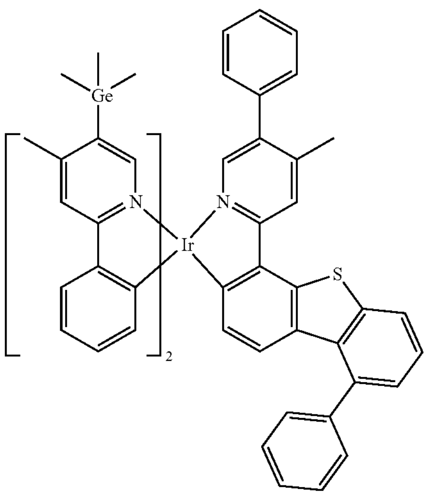
2059
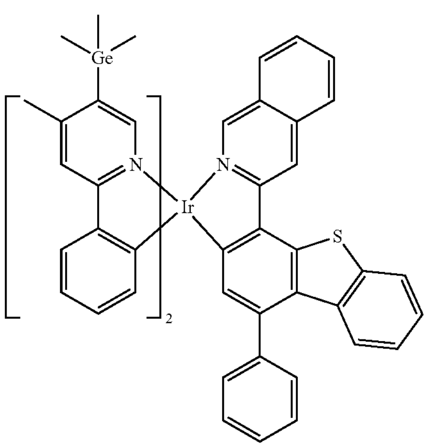
2060
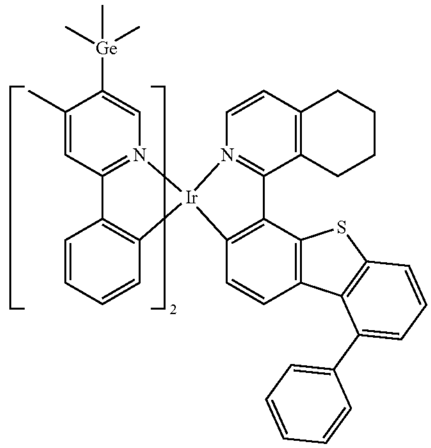
2061
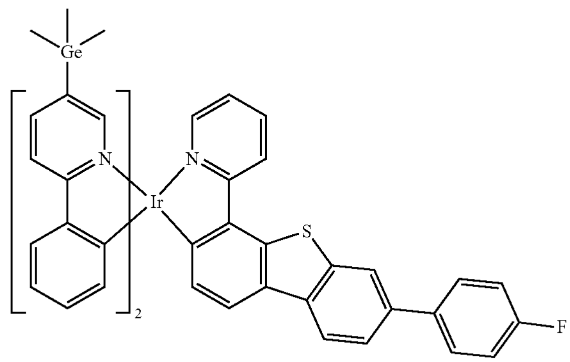
2062
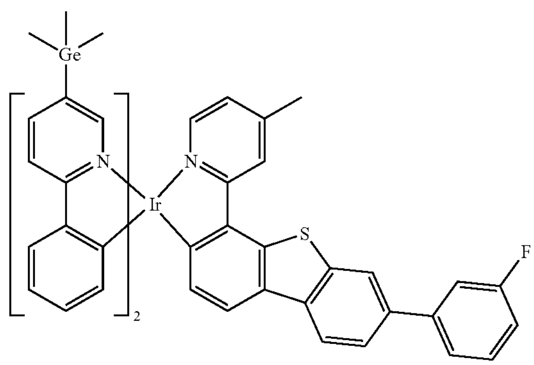
2063
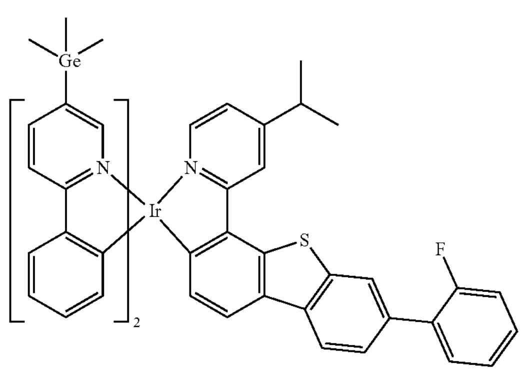

-continued
2064
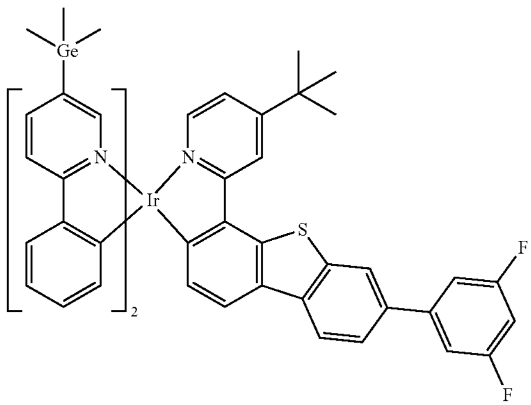
2065
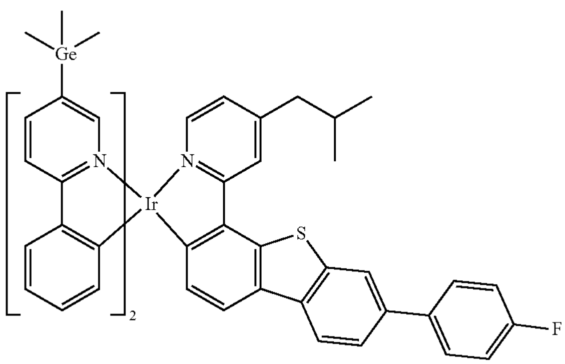
2066
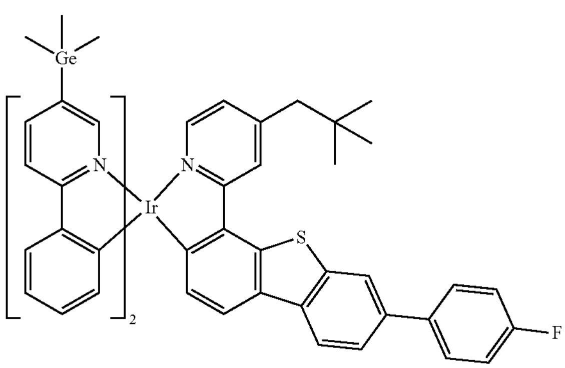
2067
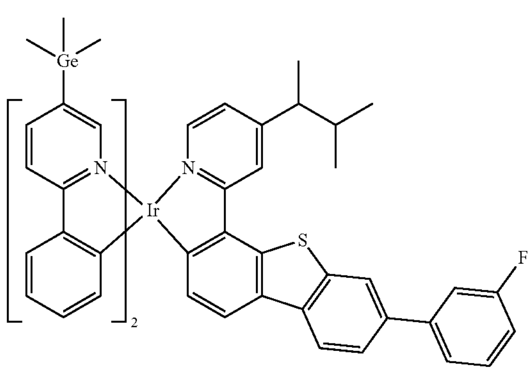
-continued
2068
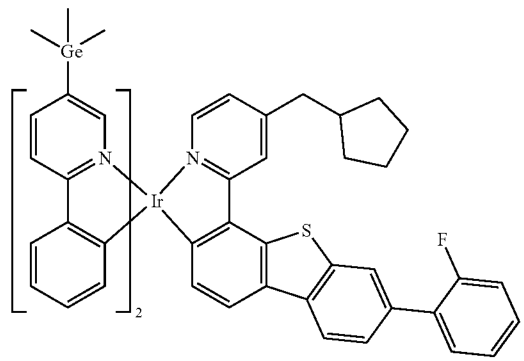
2069
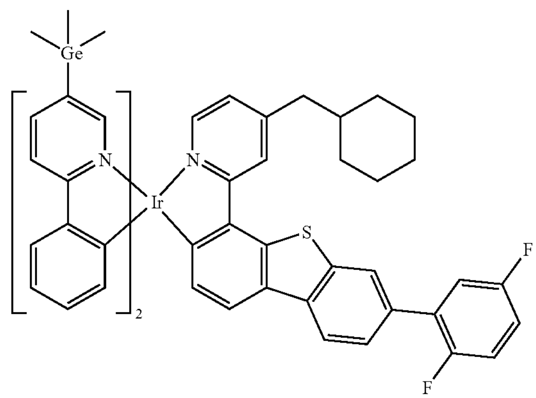
2070
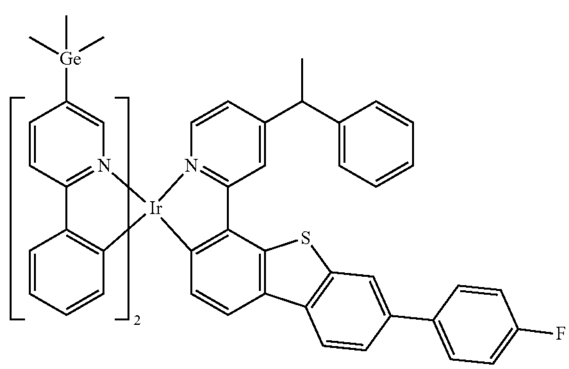
2071
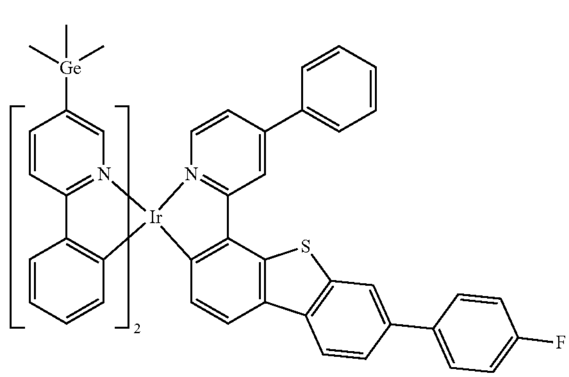

-continued
2072
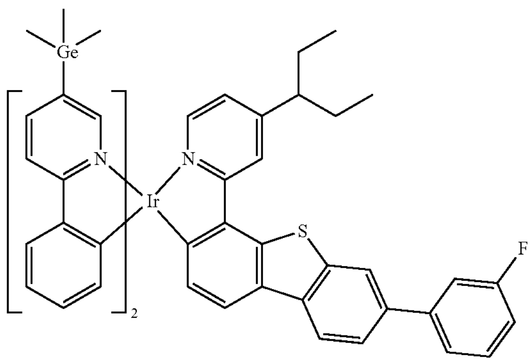
2073
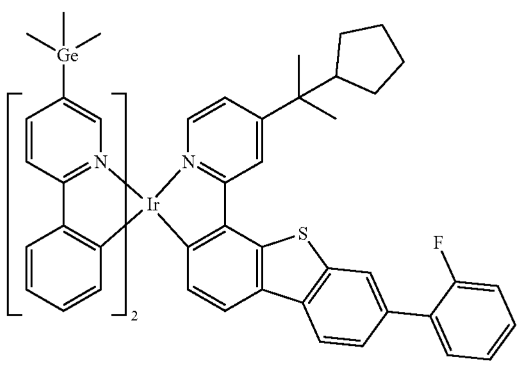
2074
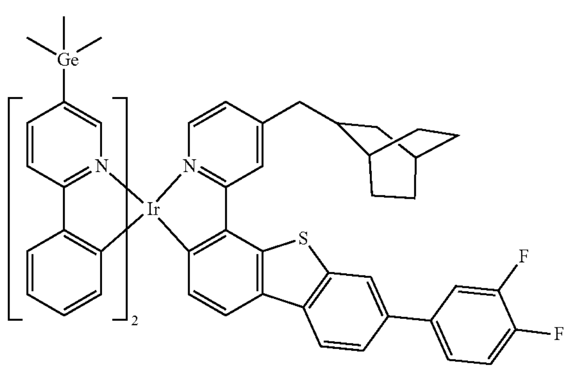
2075
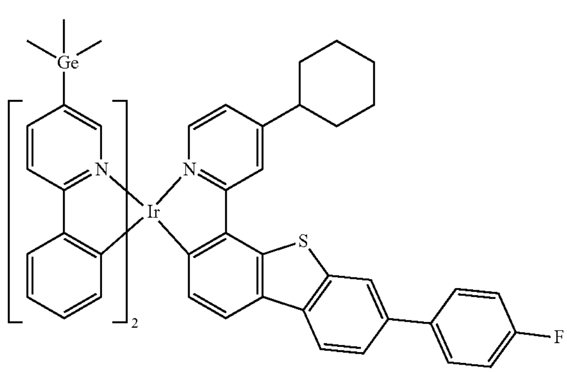
-continued
2076
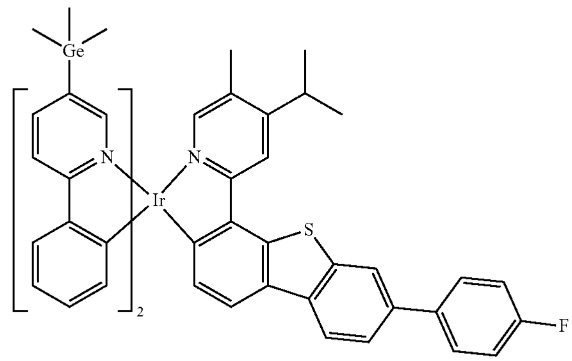
2077
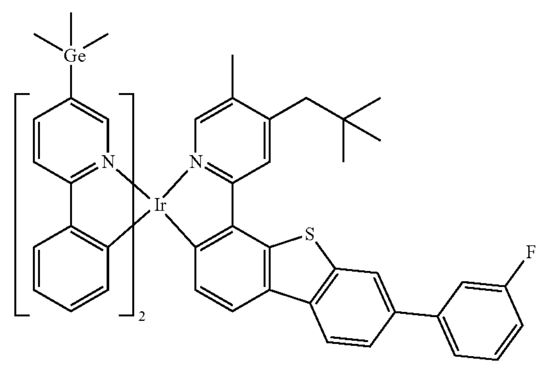
2078
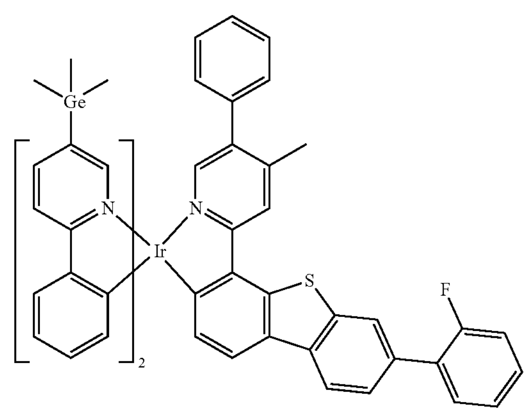
2079
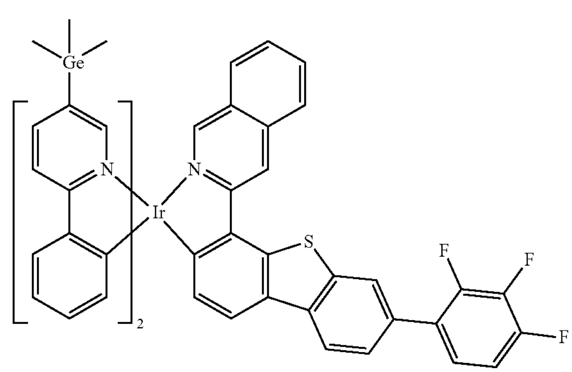

-continued
2080
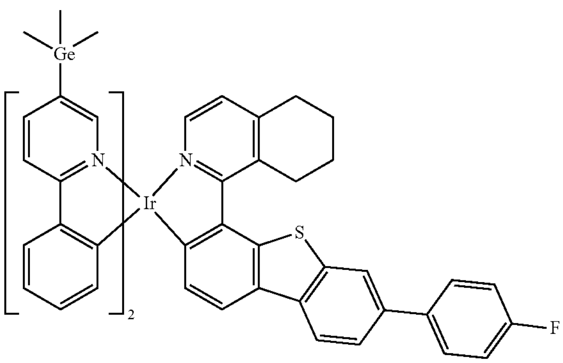
2081
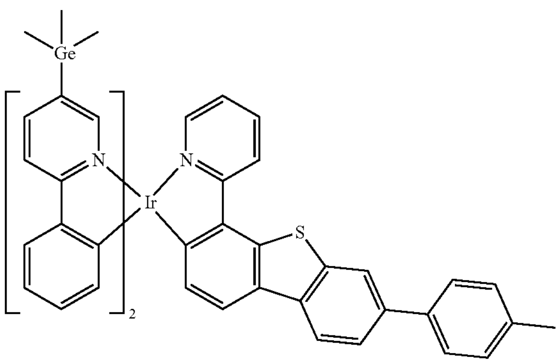
2082
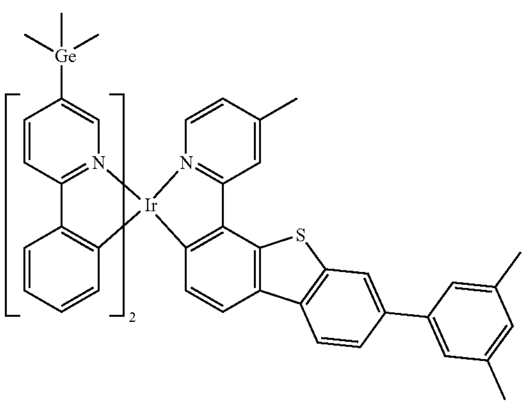
2083
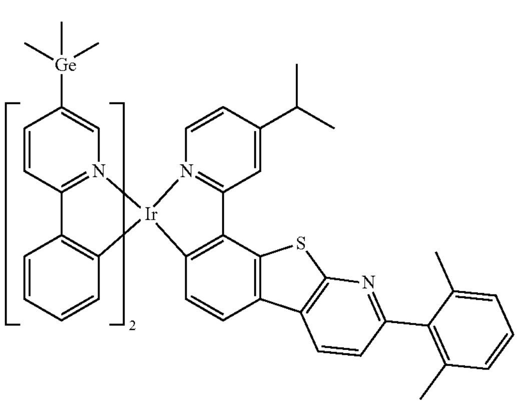
-continued
2084
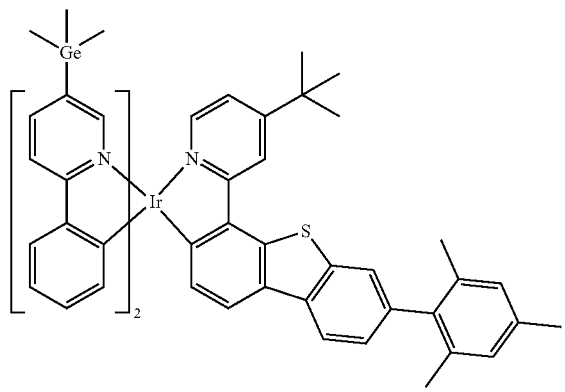
2085
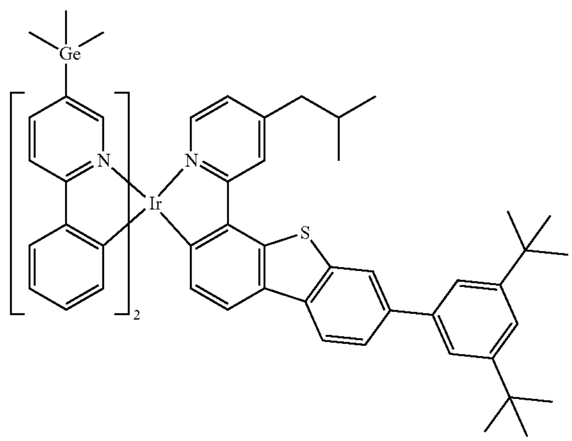
2086
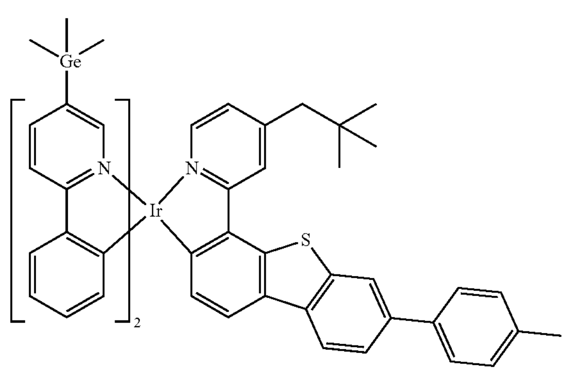

-continued
2087
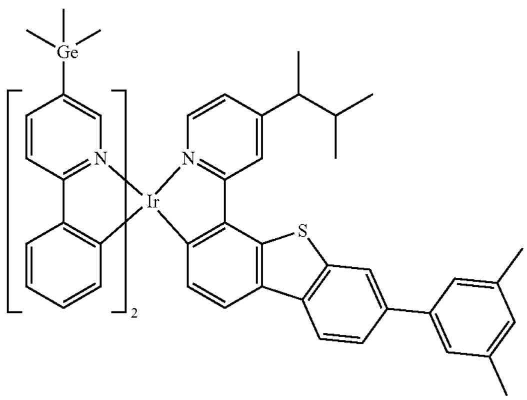
2088
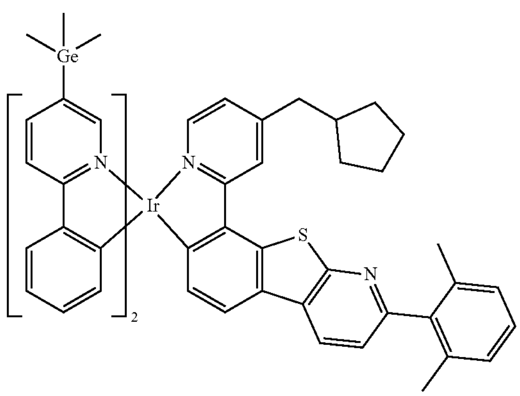
2089
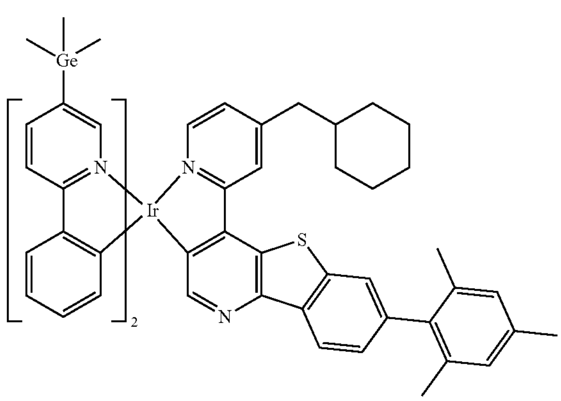
-continued
2090
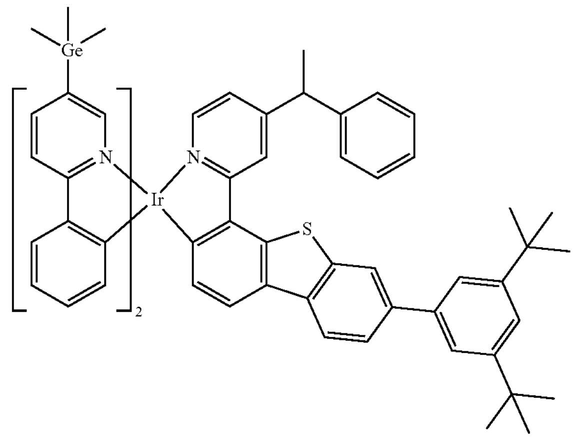
2091
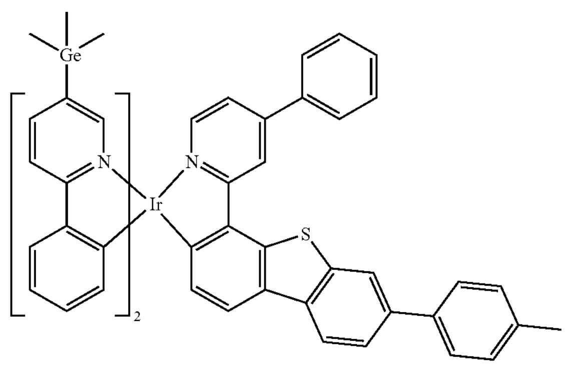
2092
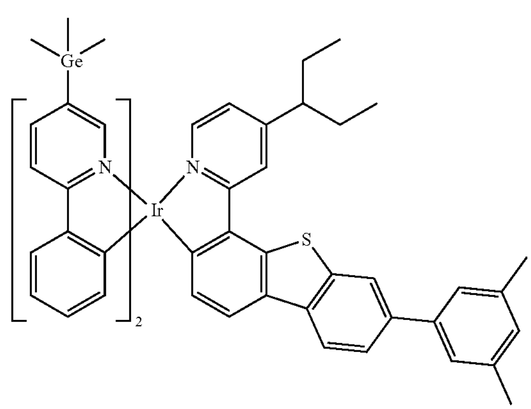

-continued
2093
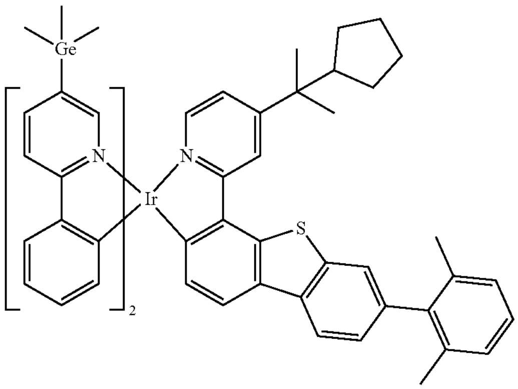
2094
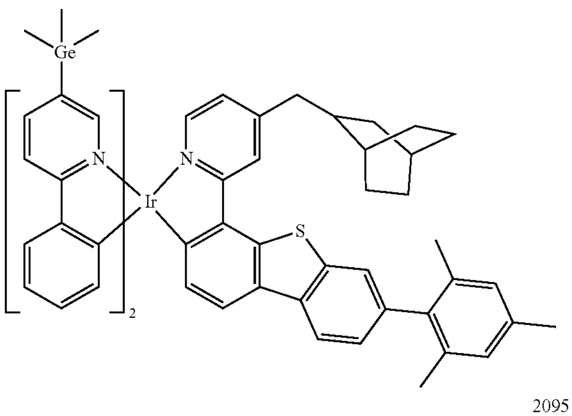
2095
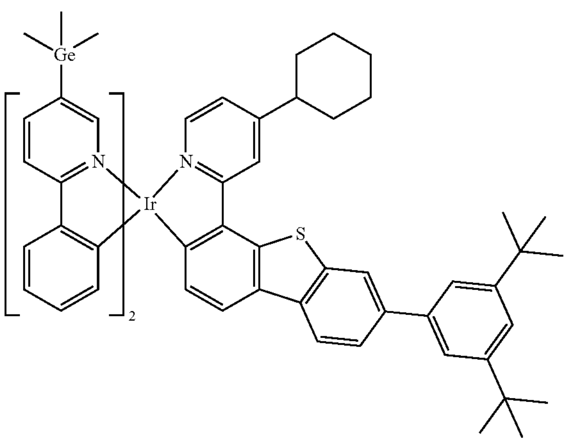
2096
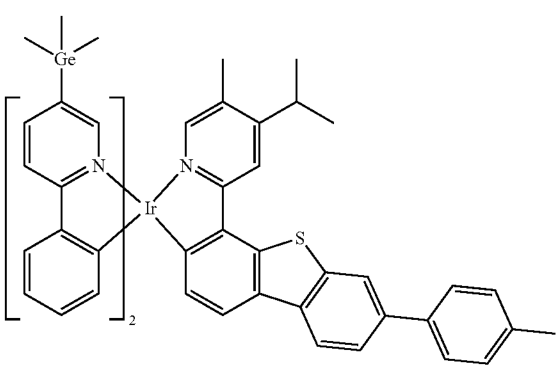
-continued
2097
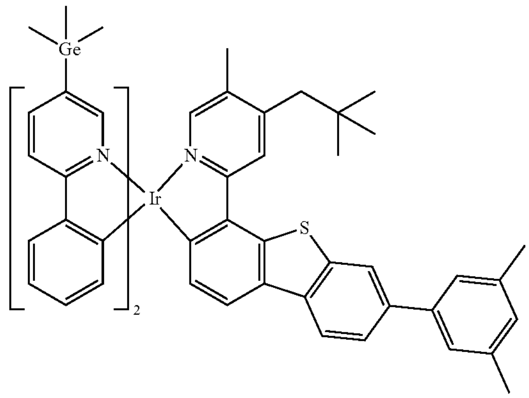
2098
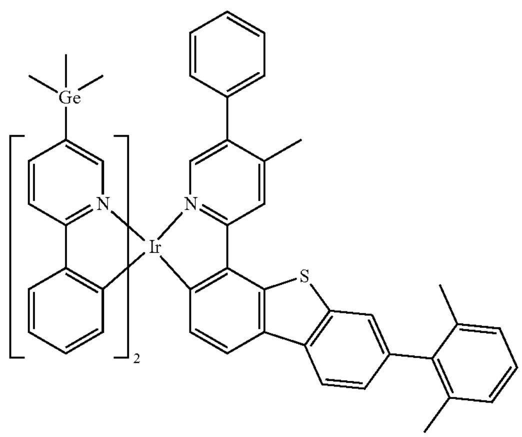
2099
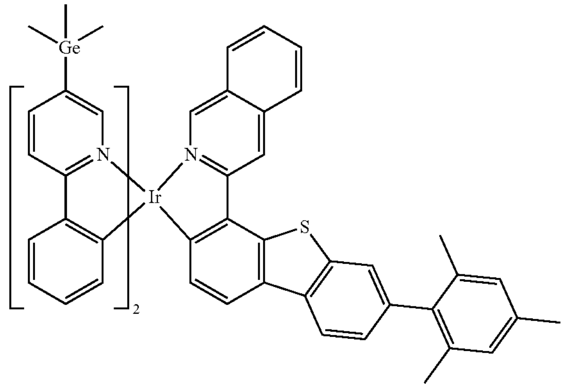

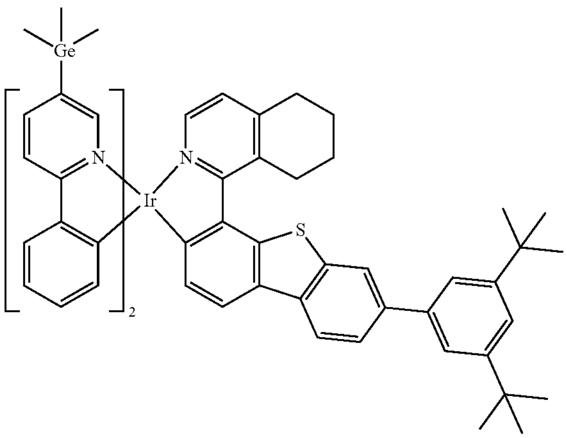
2100
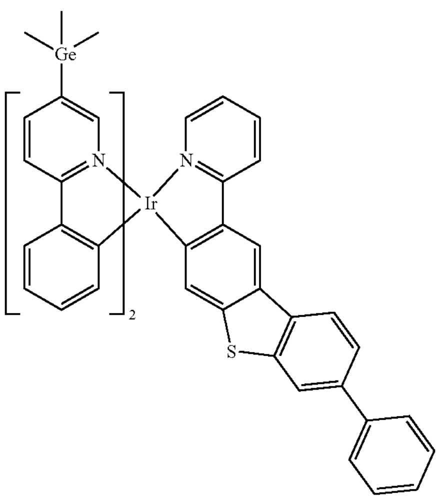
2101
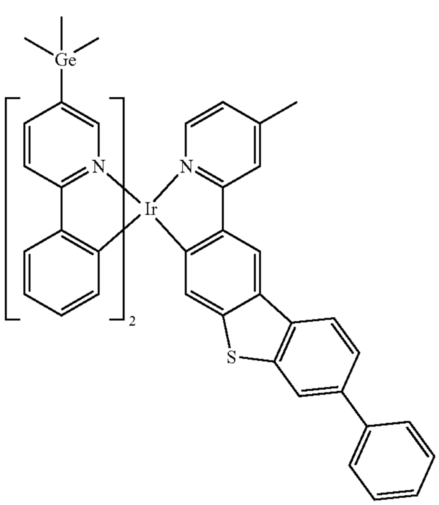
2102
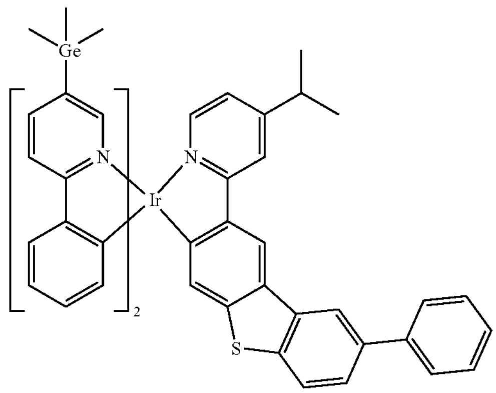
2103
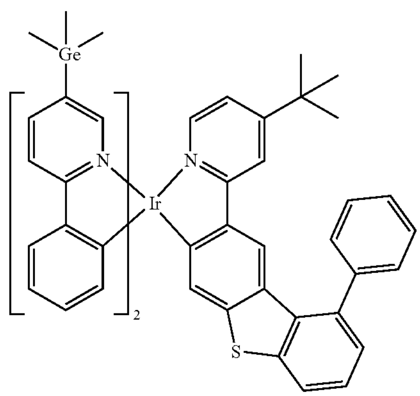
2104
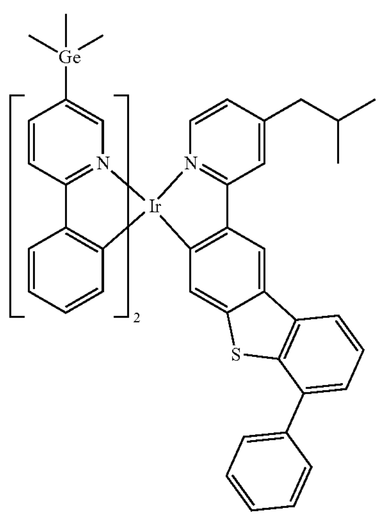
2105

-continued
2106
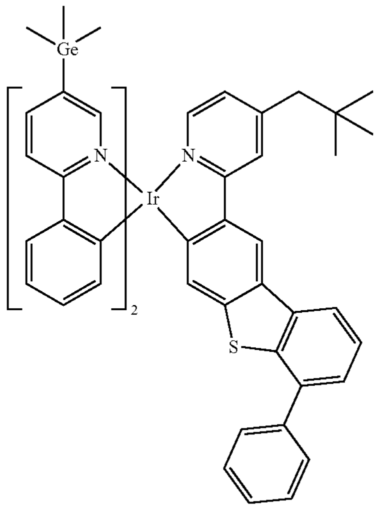
2107
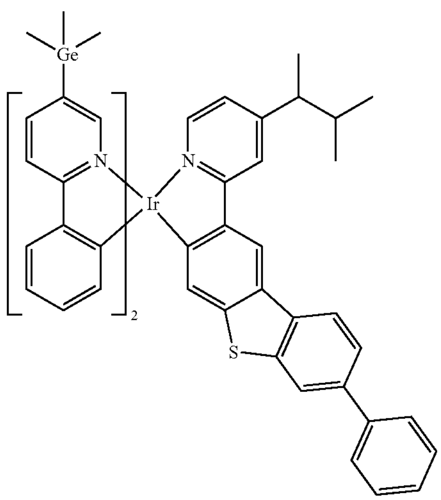
2108
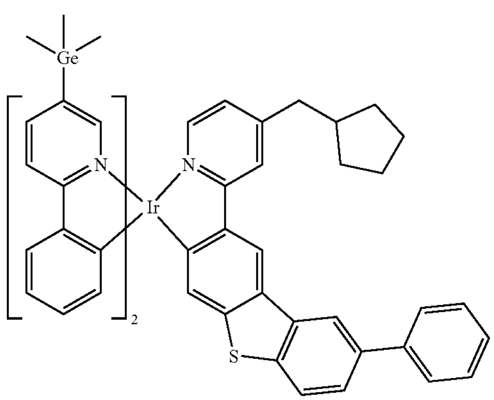
-continued
2109
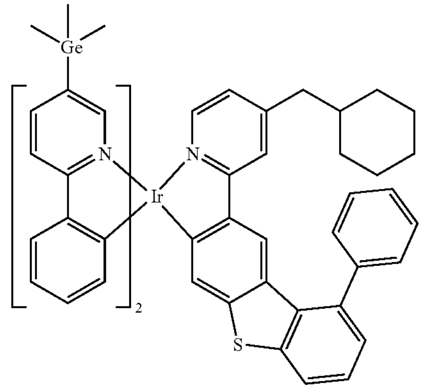
2110
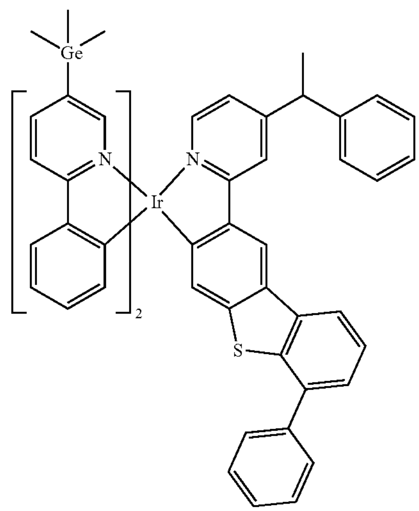
2111
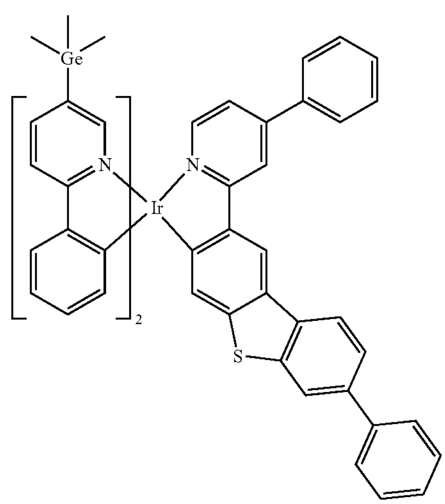

-continued
2112
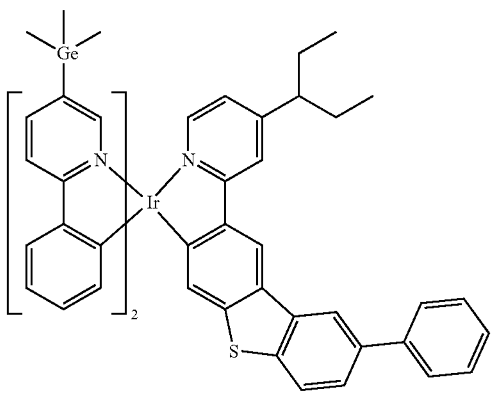
2113
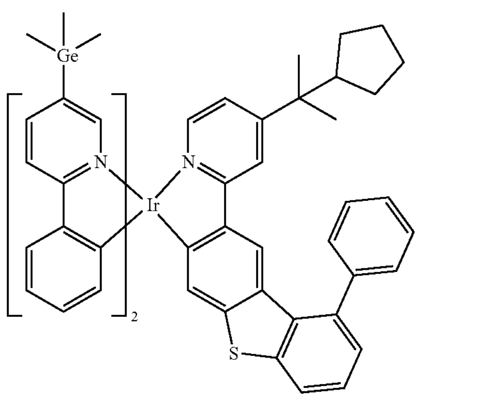
2114
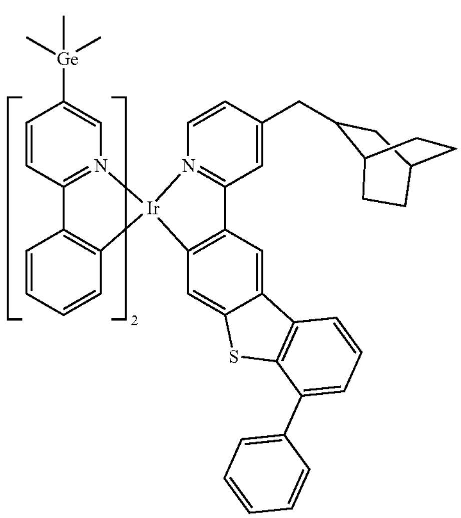
-continued
2115
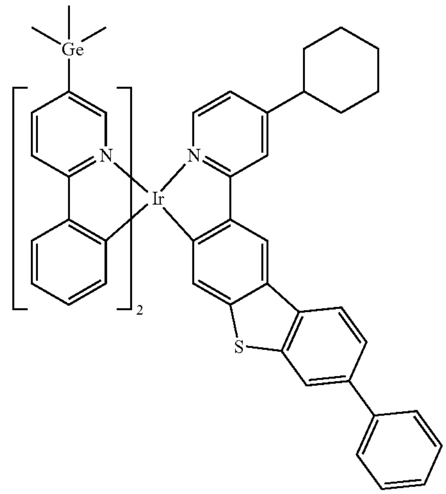
2116
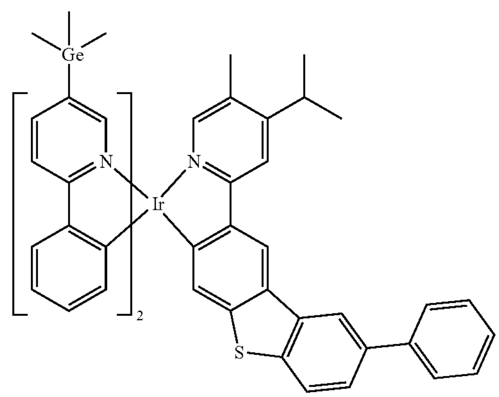
2117
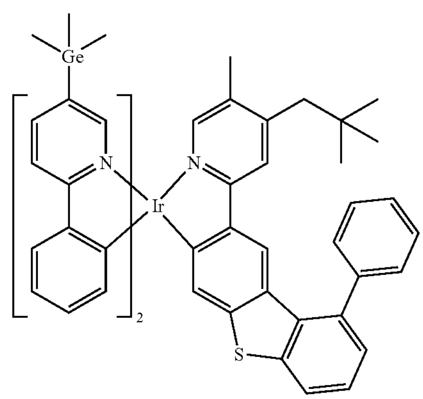

-continued
2118
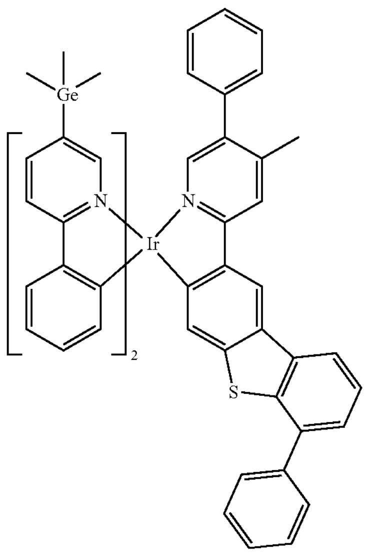
2119
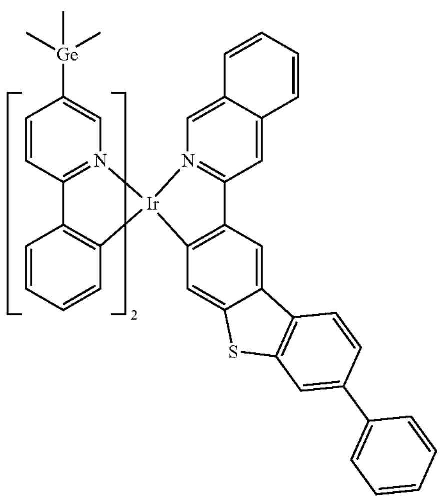
2120
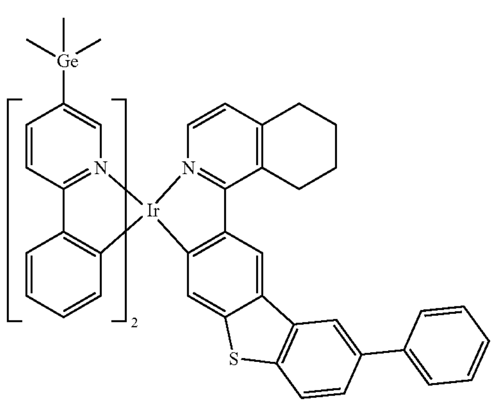
2121
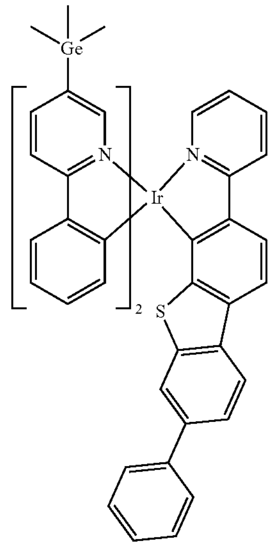
2122
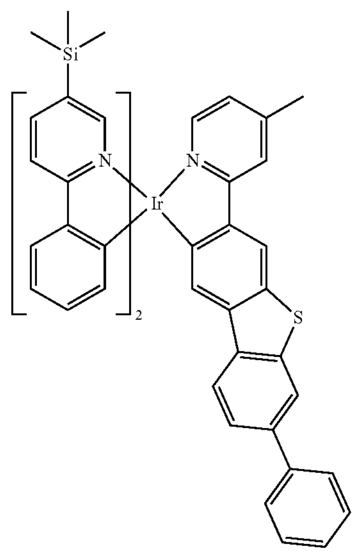
2123
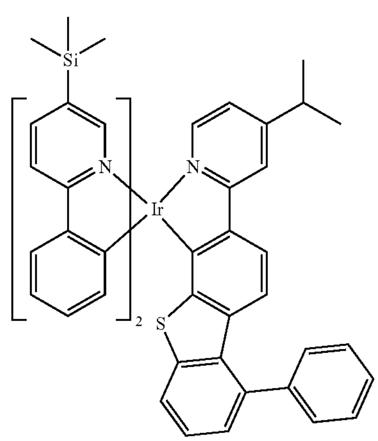

-continued
2124
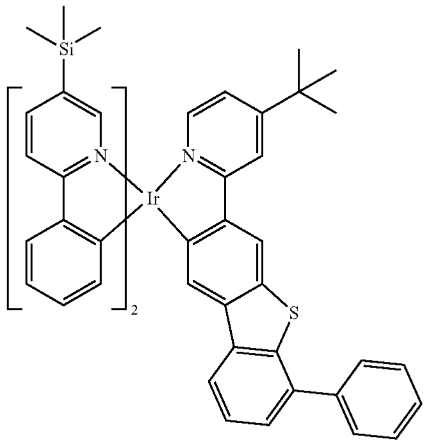
2125
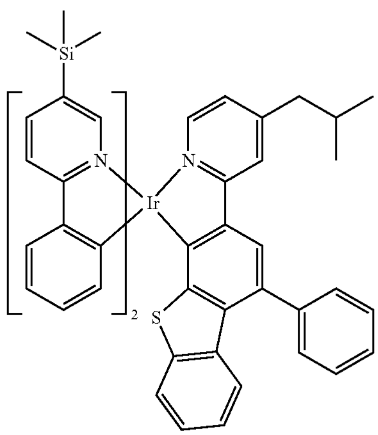
2126
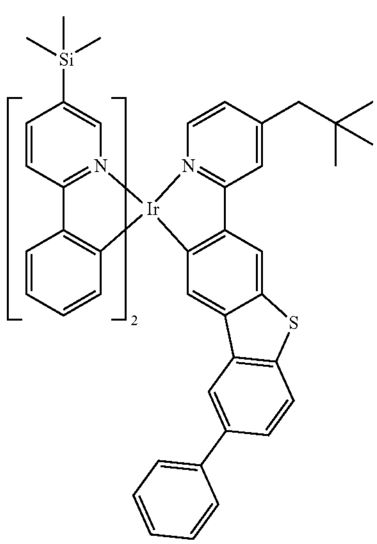
-continued
2127
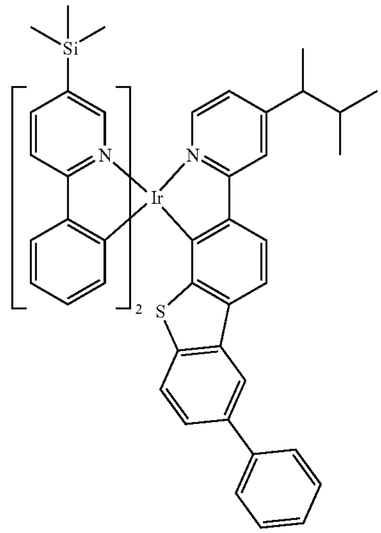
2128
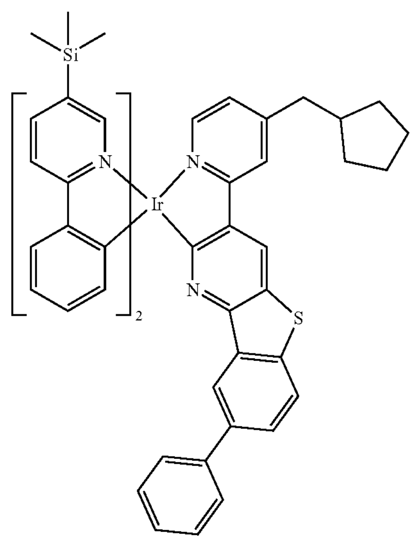
2129
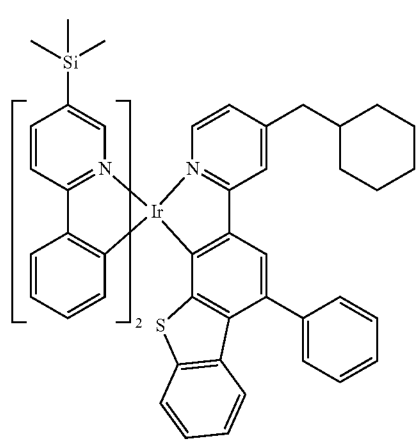

2130
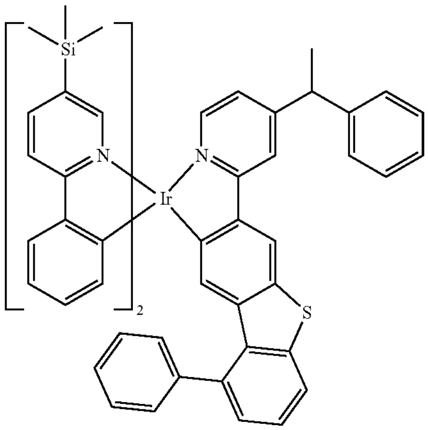
2131
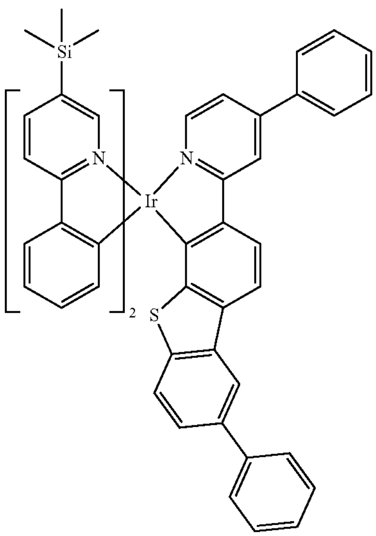
2132
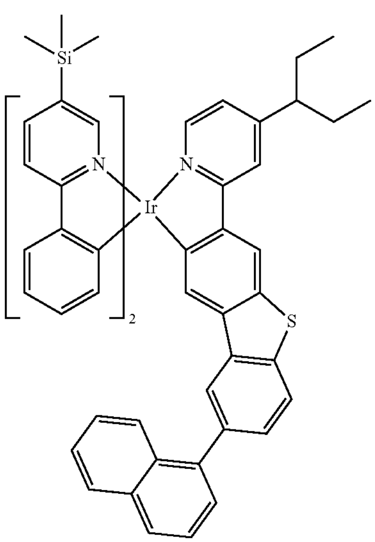
2133
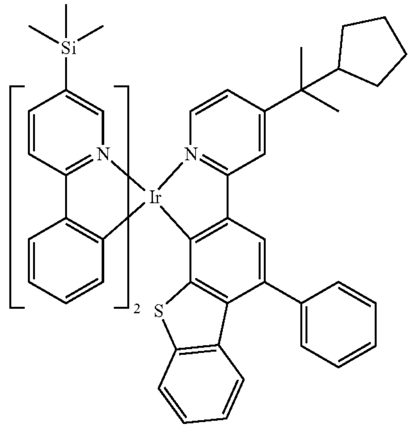
2134
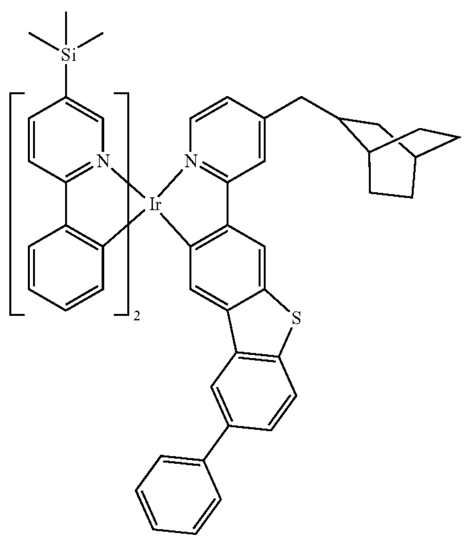
2135
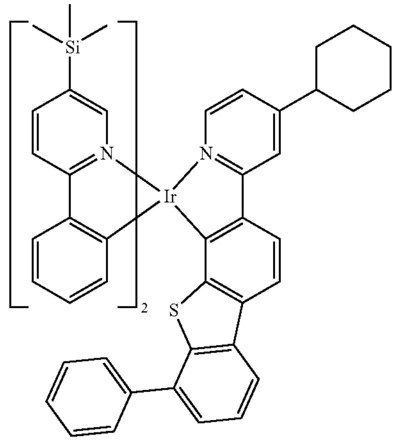

-continued
2136
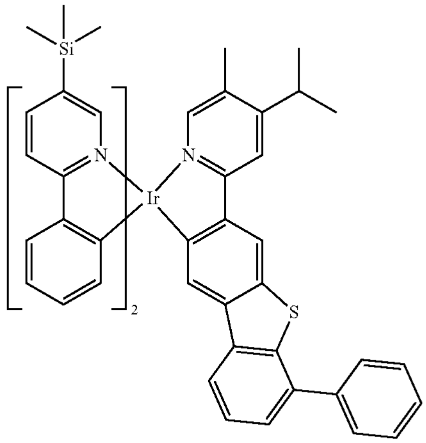
2137
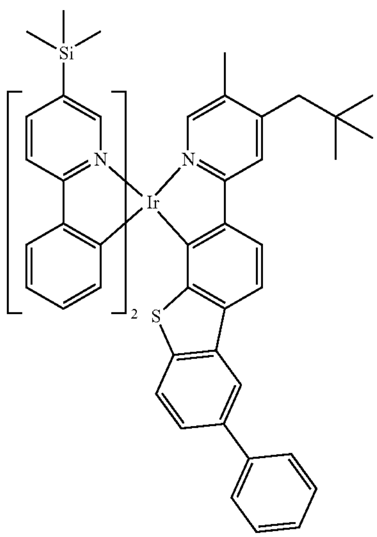
2138
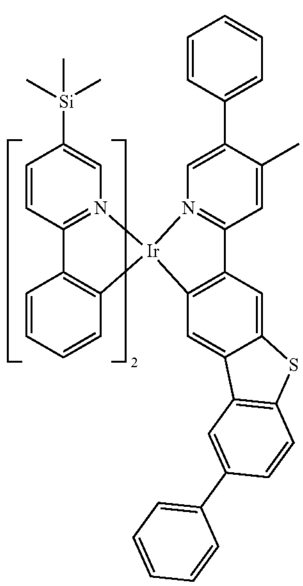
-continued
2139
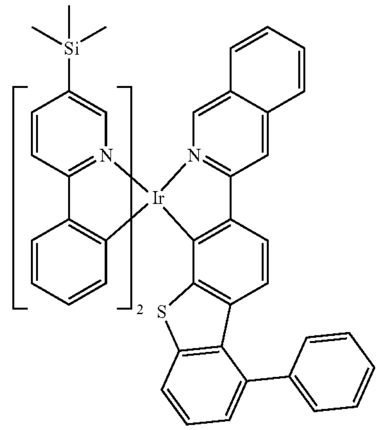
2140
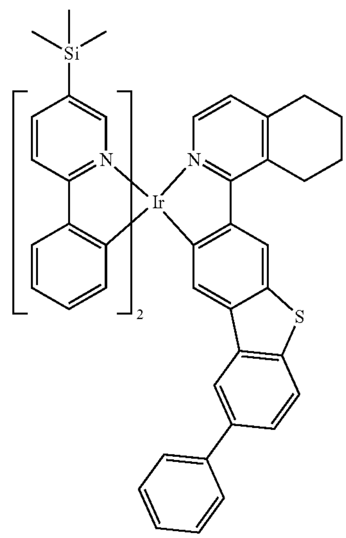
2141
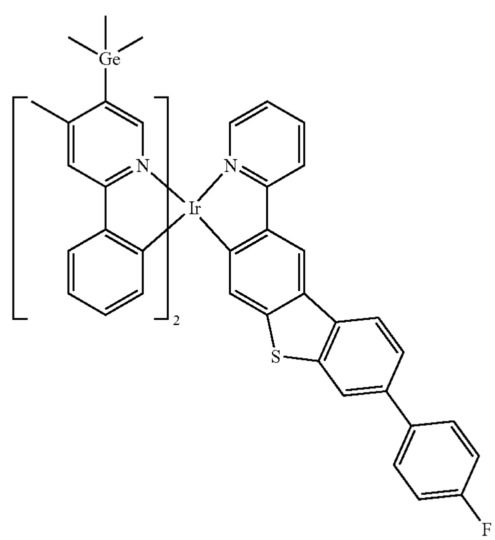

2142
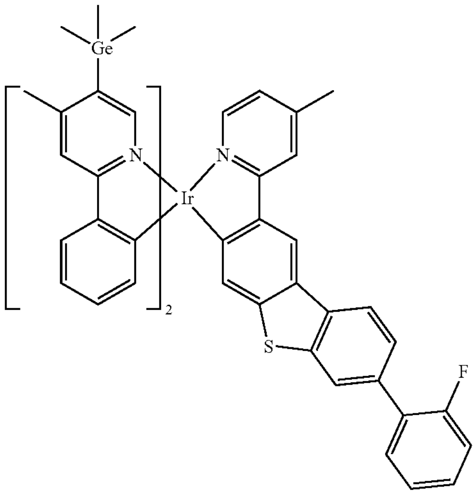
2143
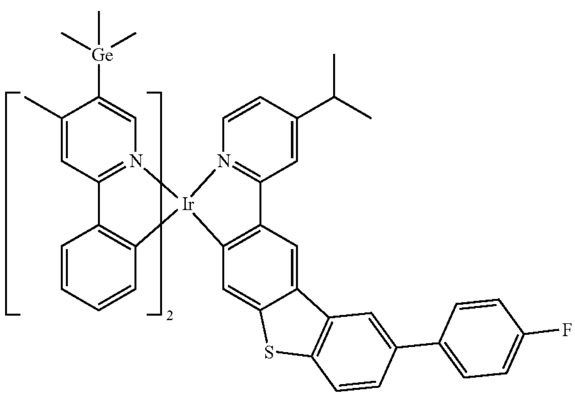
2144
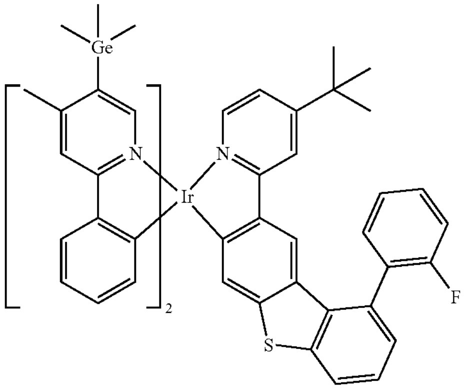
2145
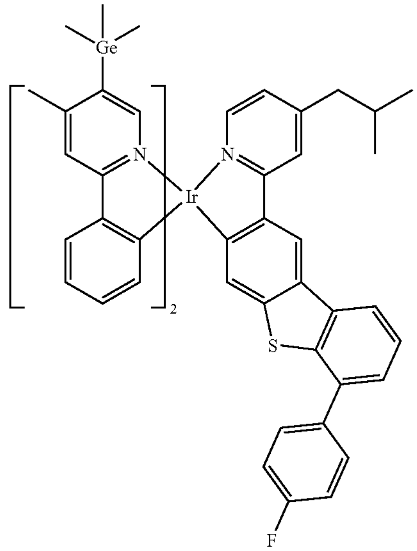
2146
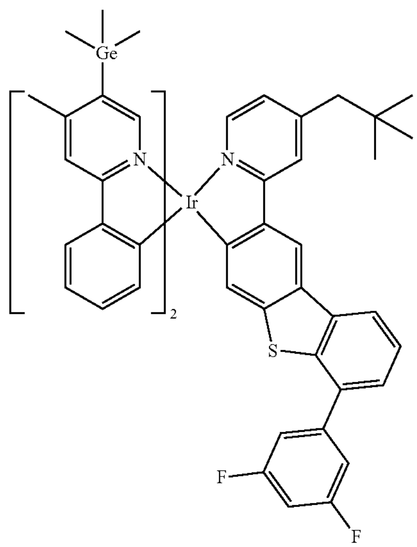
2147
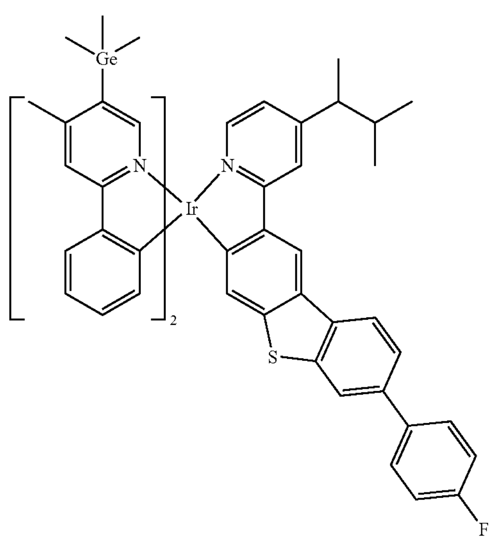

-continued
2148
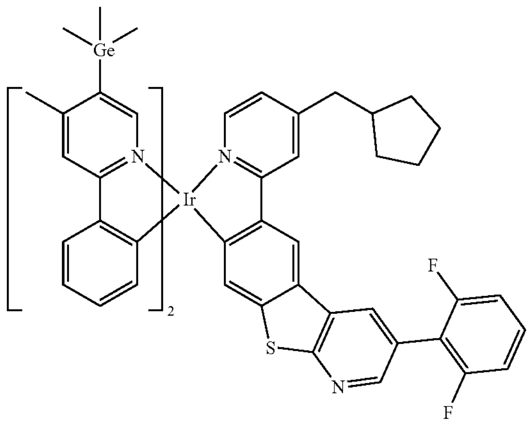
2149
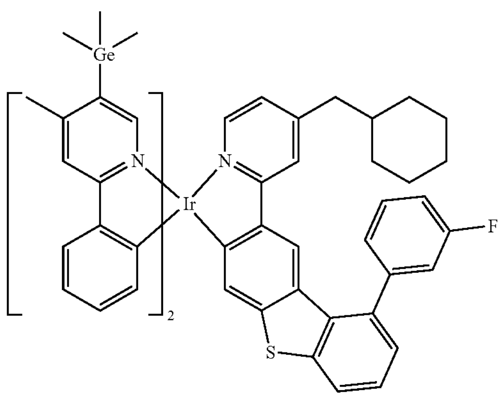
2150
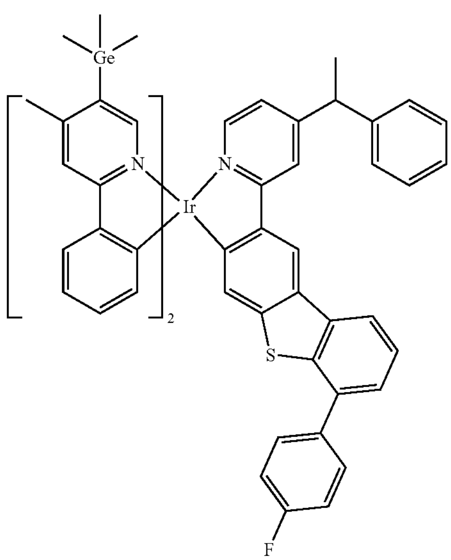
-continued
2151
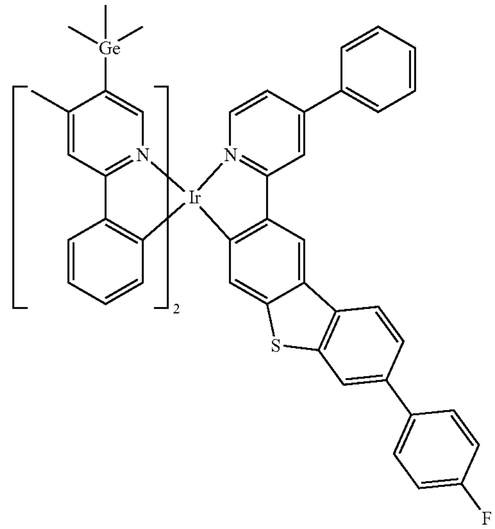
2152
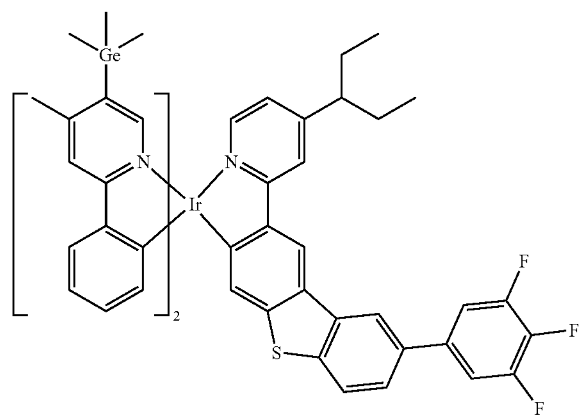
2153
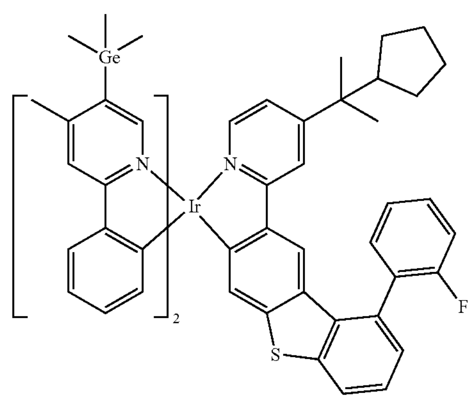

-continued
2154
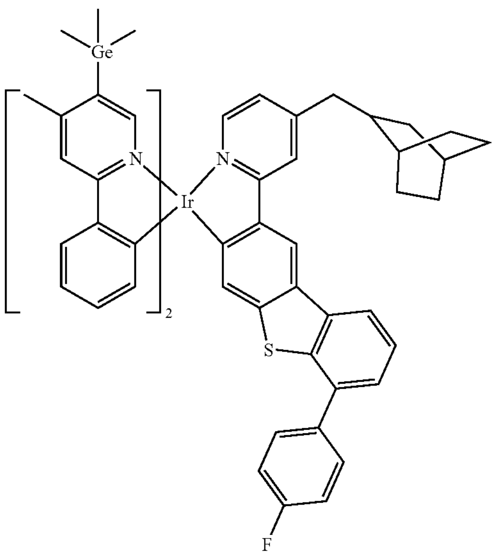
2155
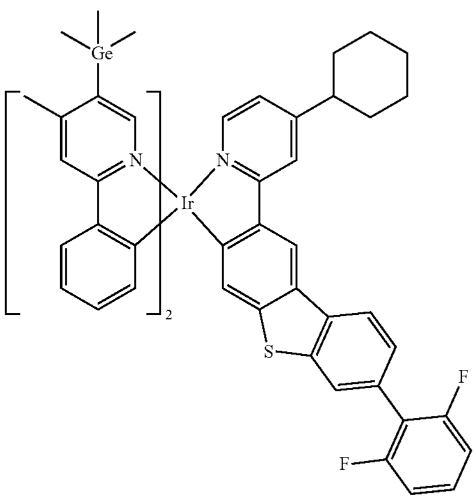
2156
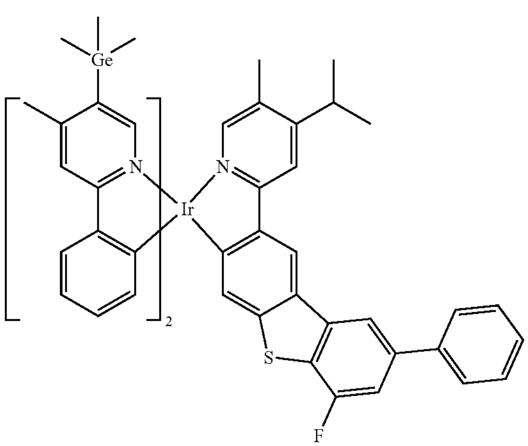
-continued
2157
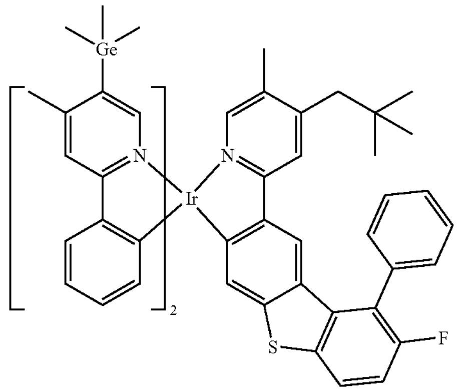
2158
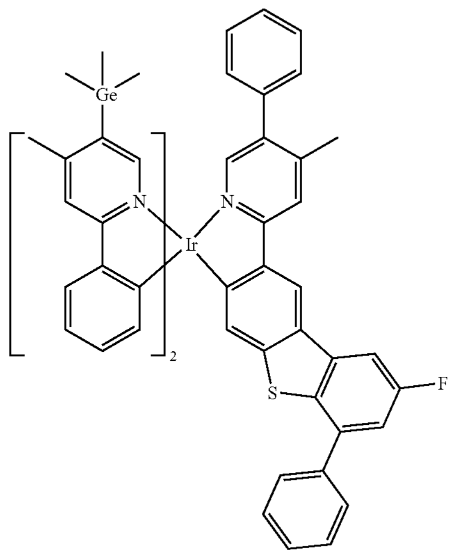
2159
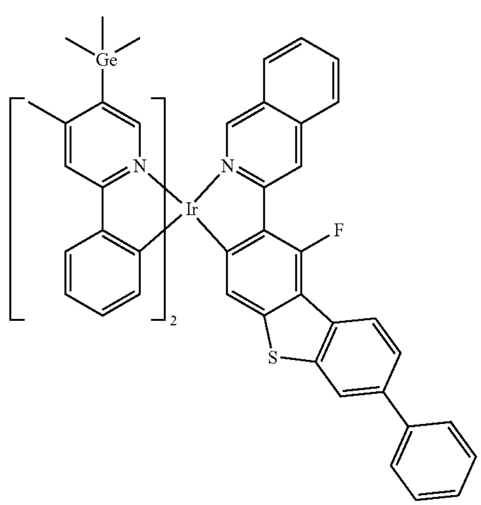

-continued
2160
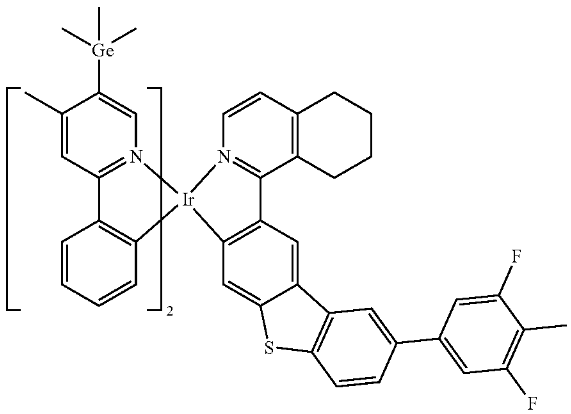
2161
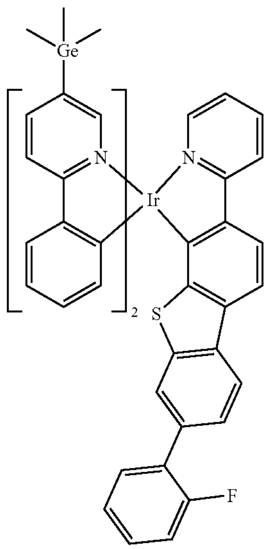
2162
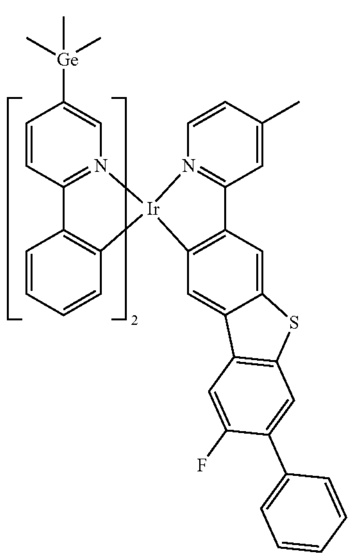
-continued
2163
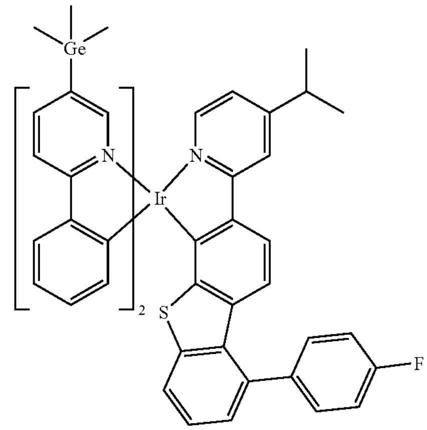
2164
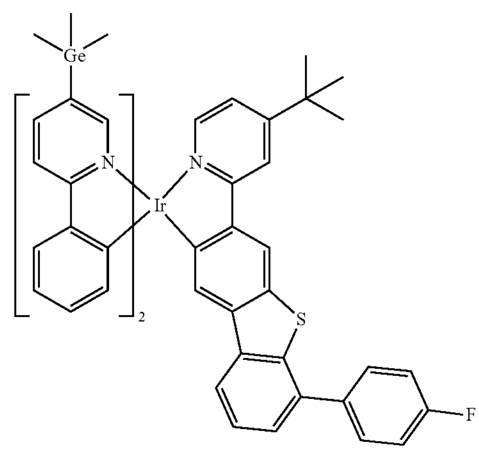
2165
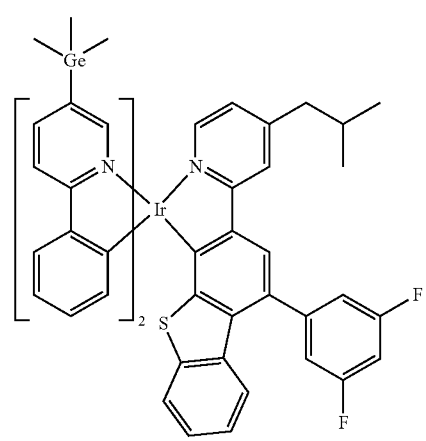

2166
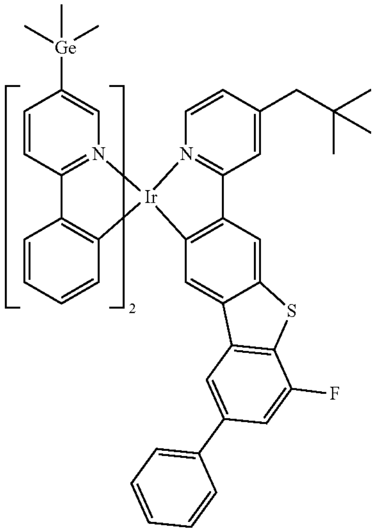
2167
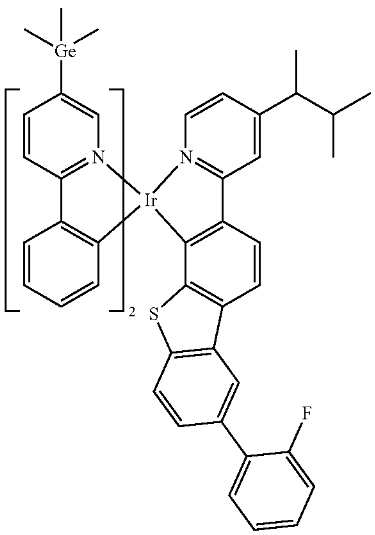
2168
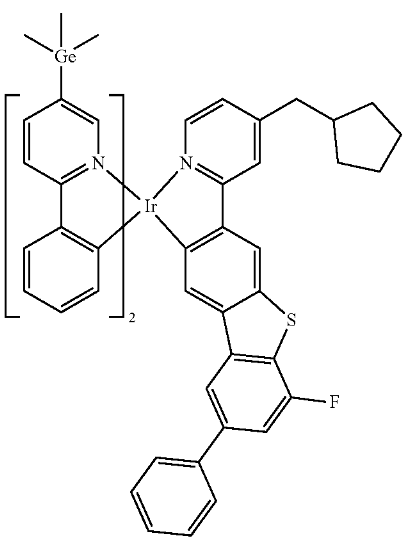
2169
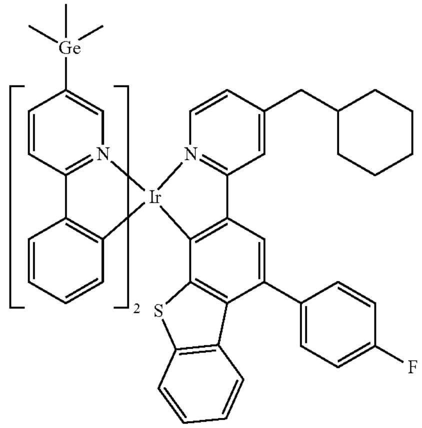
2170
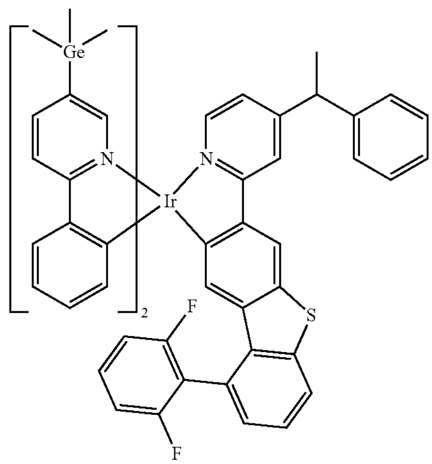
2171
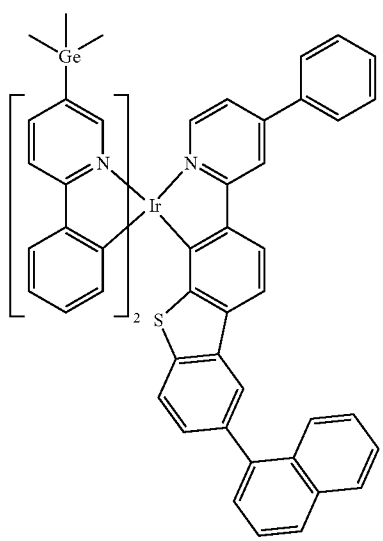

2172
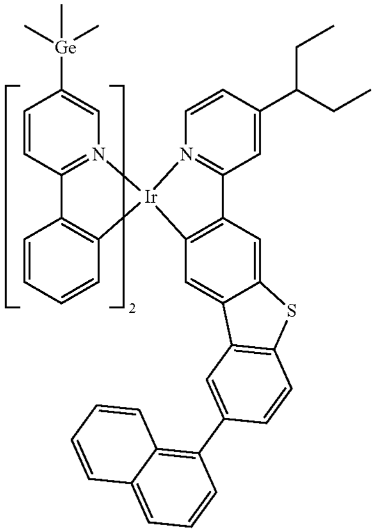
2173
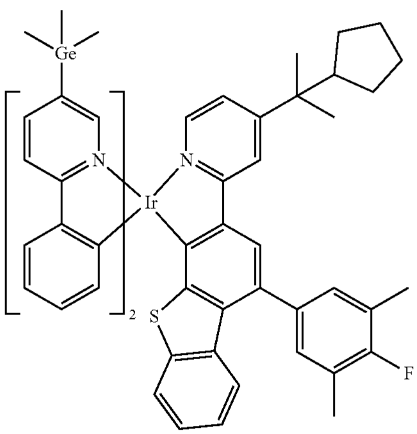
2174
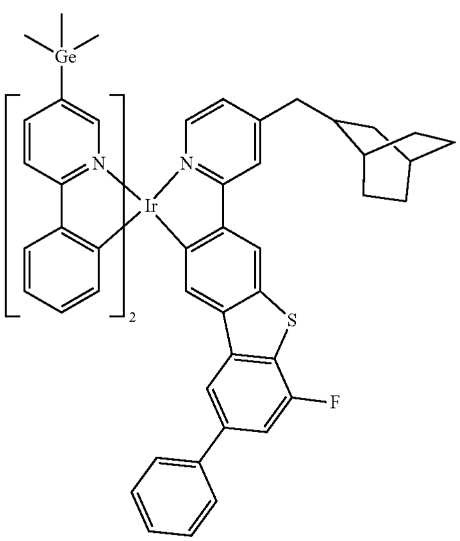
2175
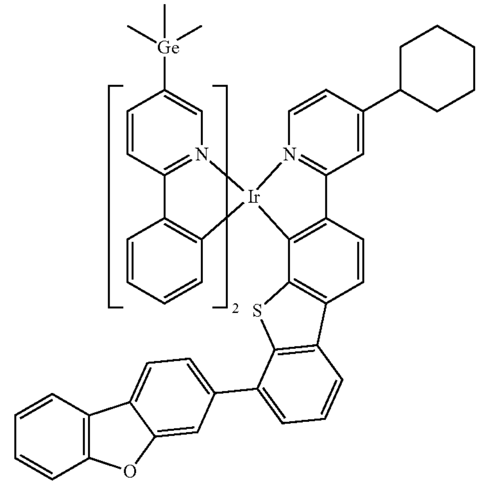
2176
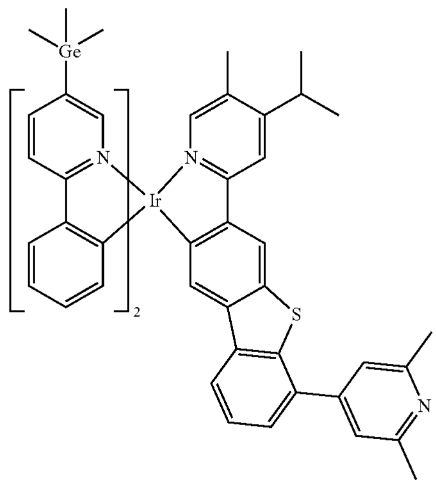
2177
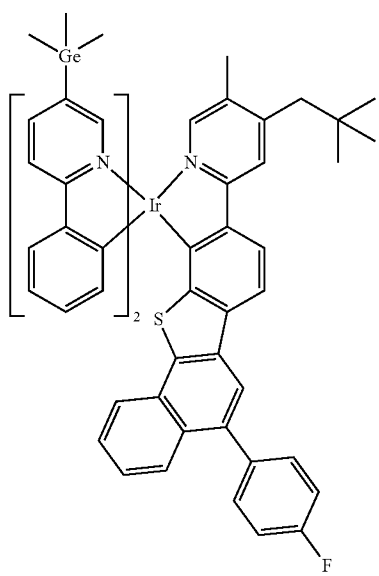

2178
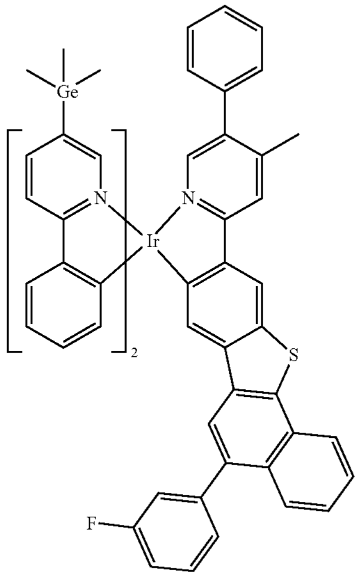
2179
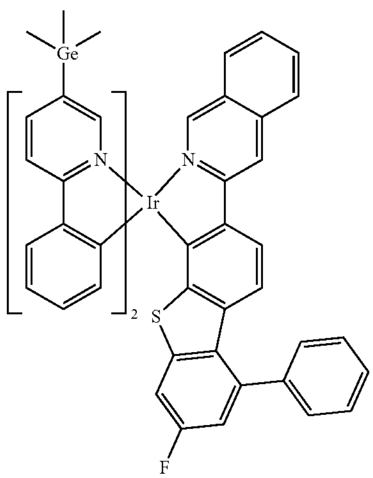
2180
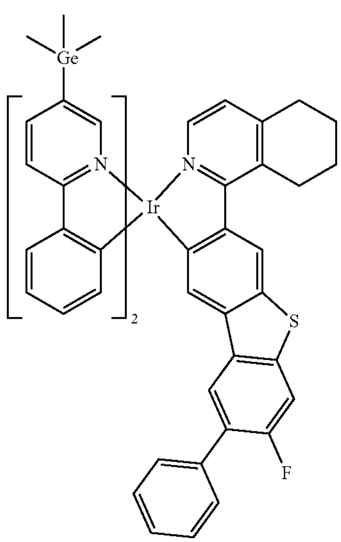
2181
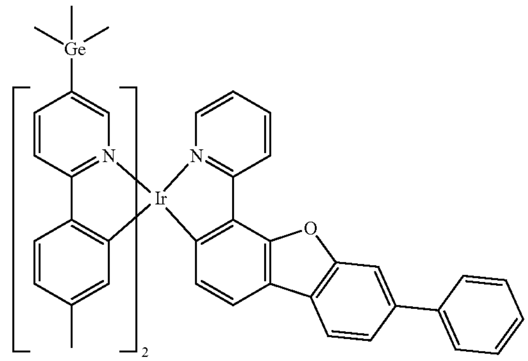
2182
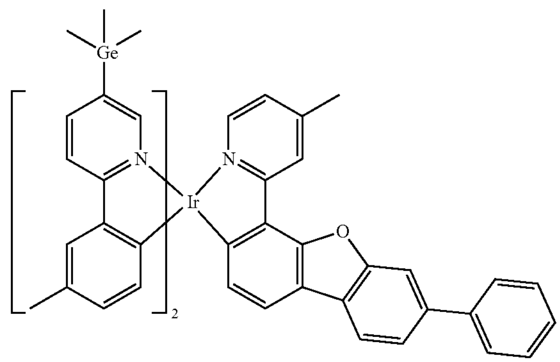
2183
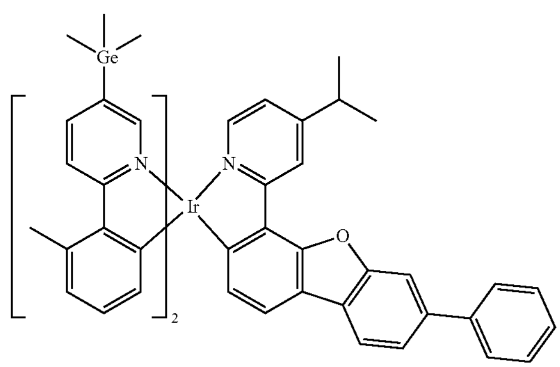
2184
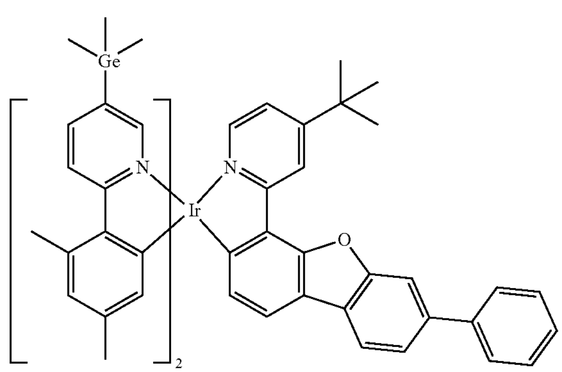

-continued
2185
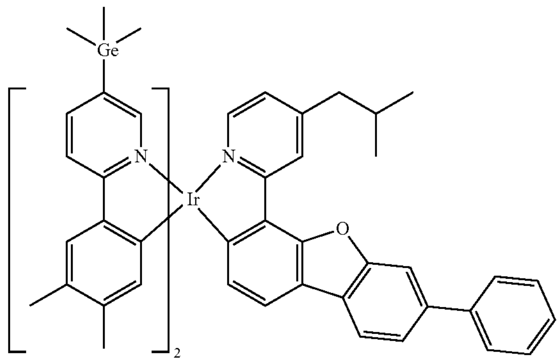
2186
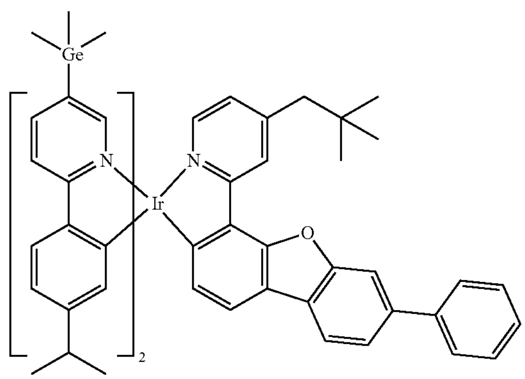
2187
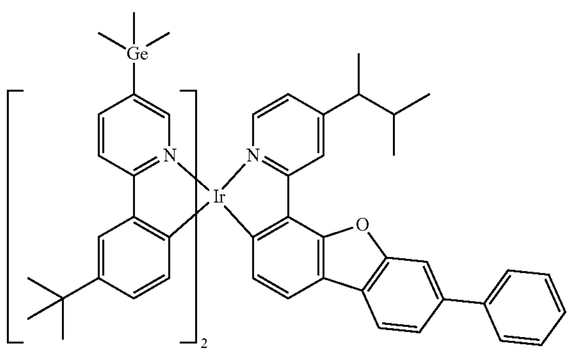
2188
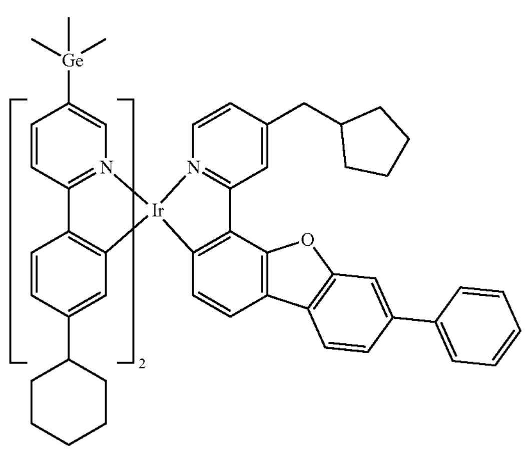
-continued
2189
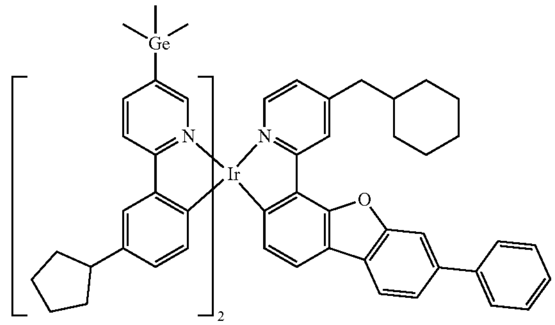
2190
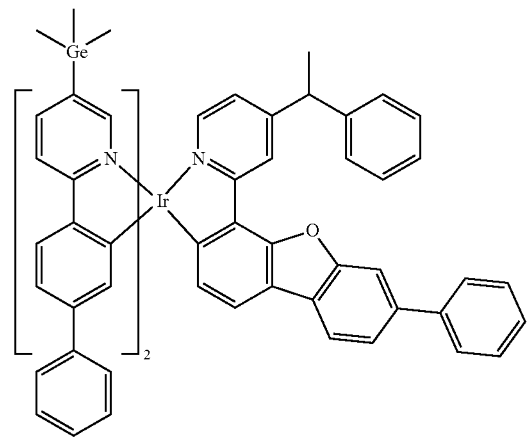
2191
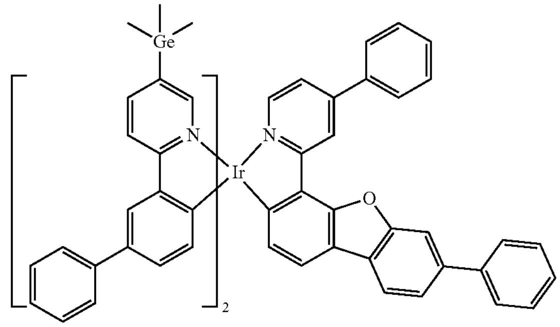
2192
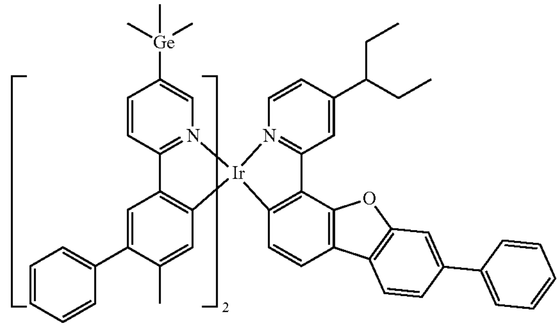

-continued
2193
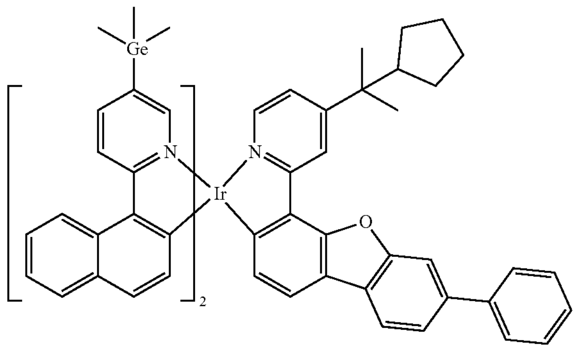
2194
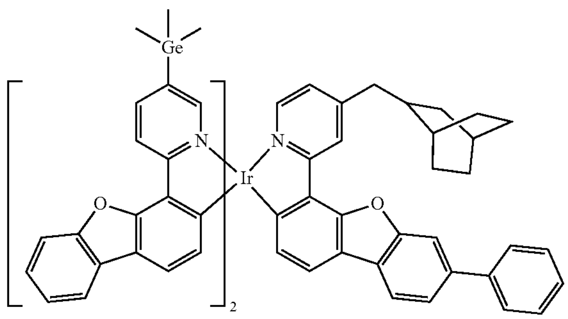
2195
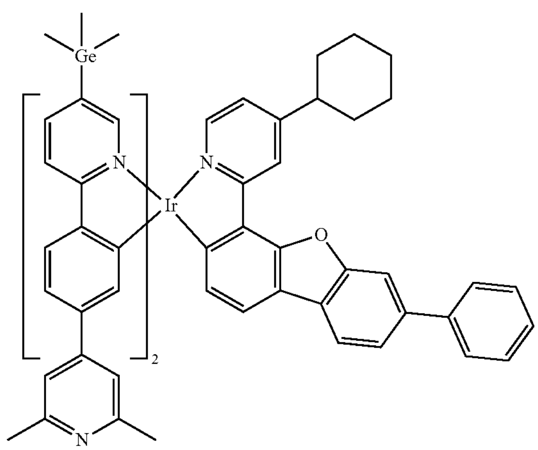
2196
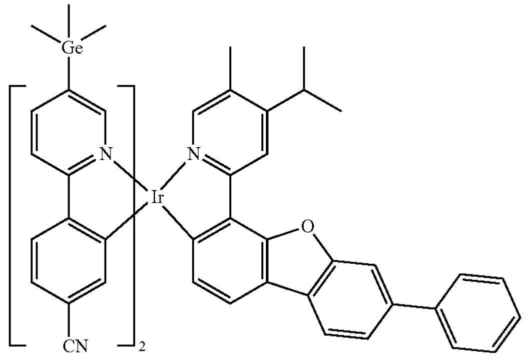
-continued
2197
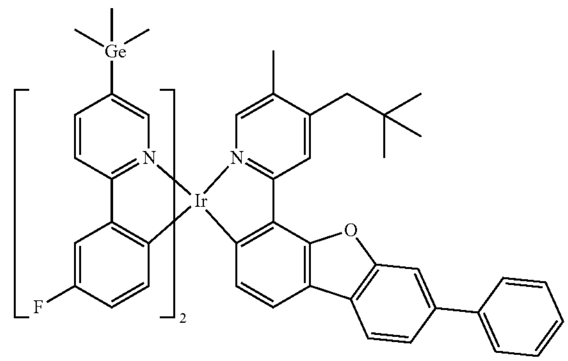
2198
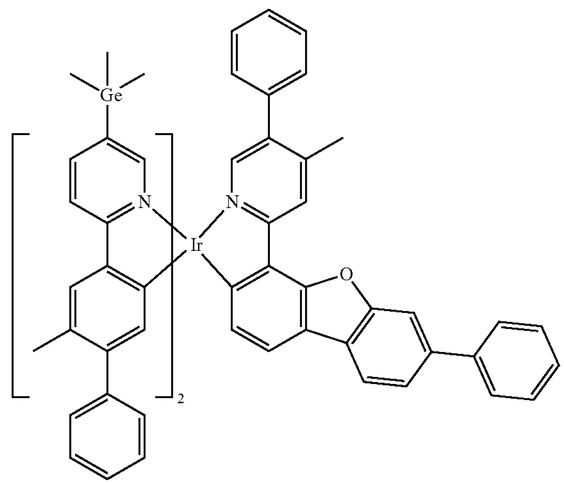
2199
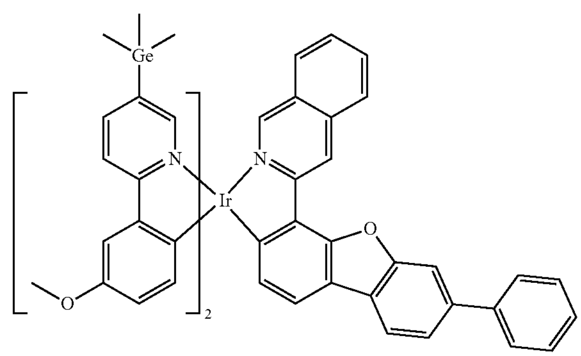
2200
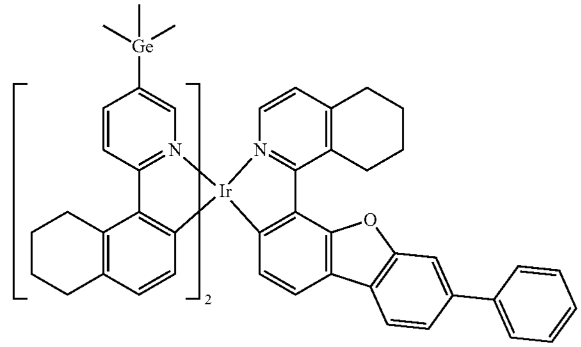

2201
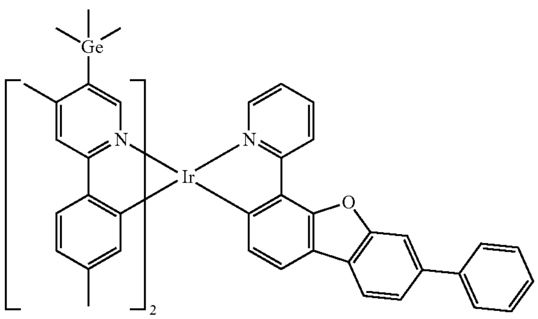
2202
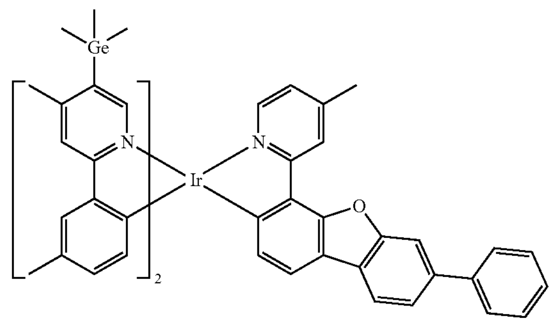
2203
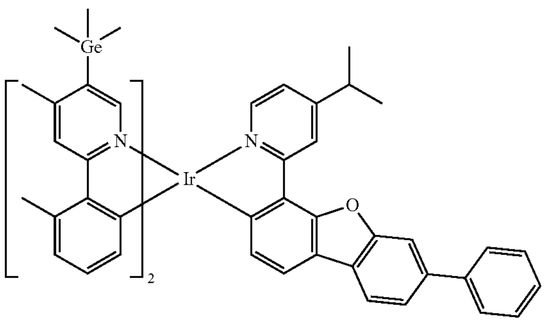
2204
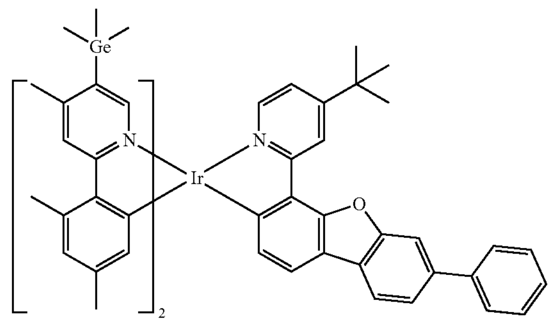
2205
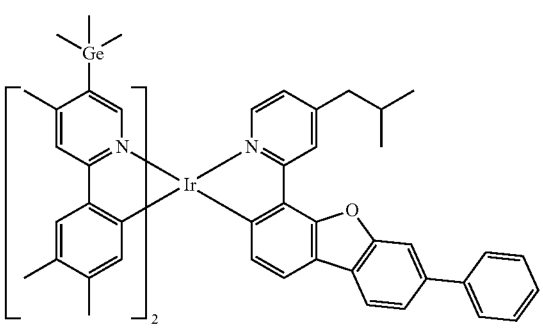
2206
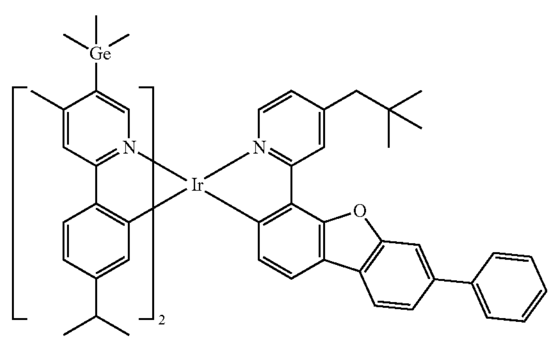
2207
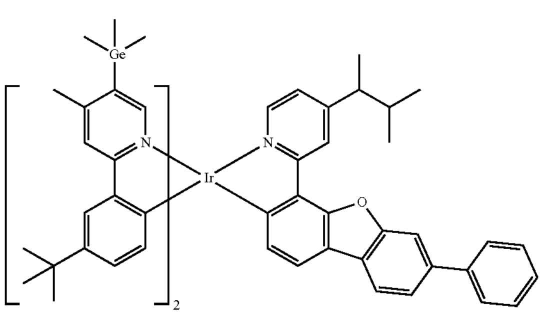
2208
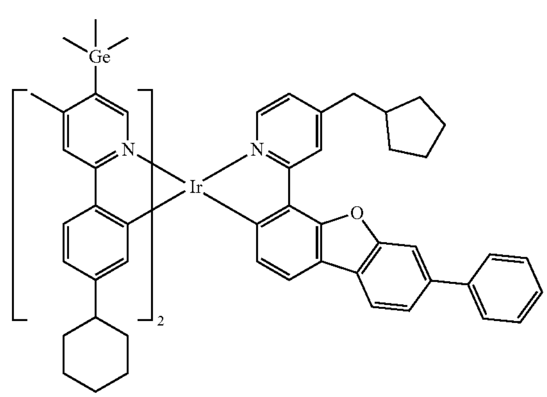

-continued
2209
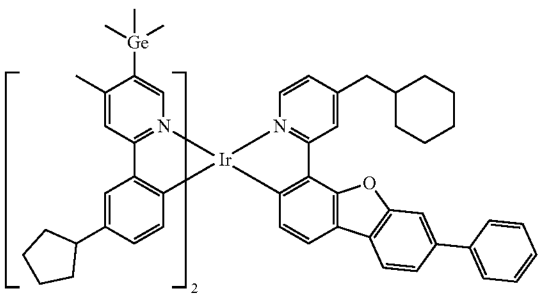
2210
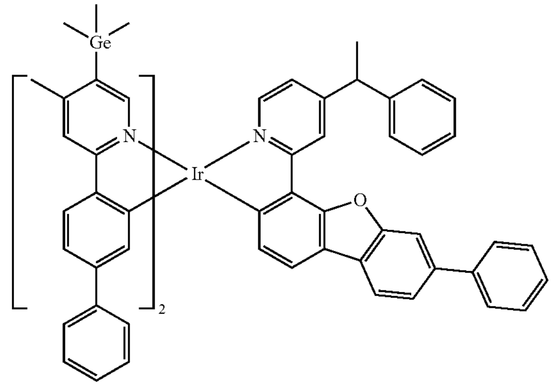
2211
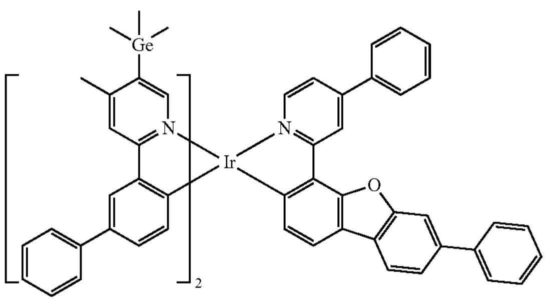
2212
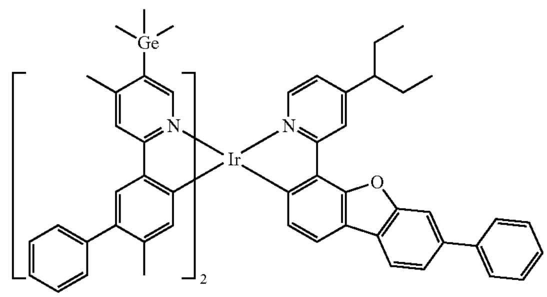
2213
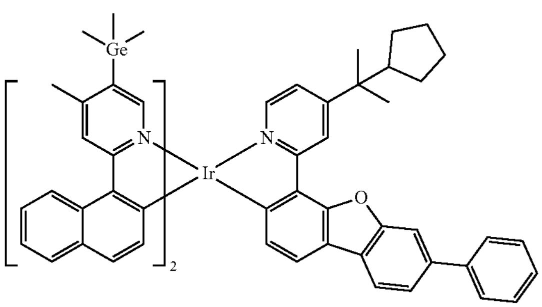
2214
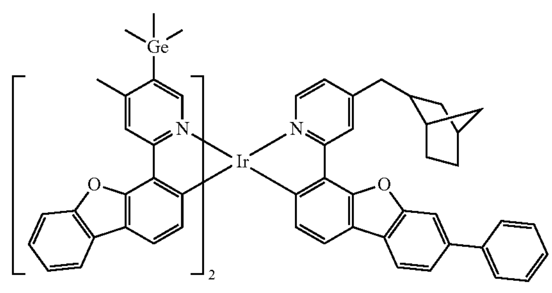
2215
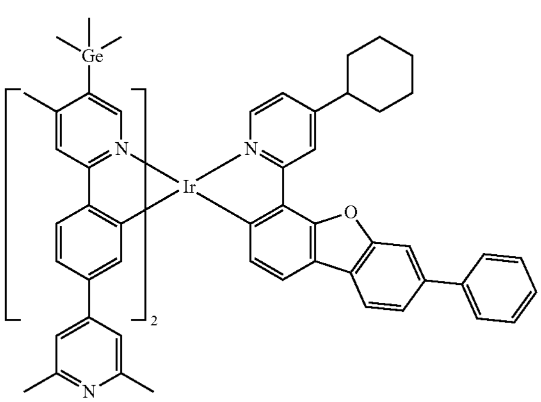
2216
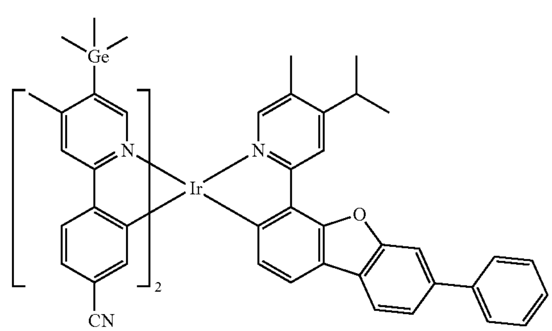

-continued
2217
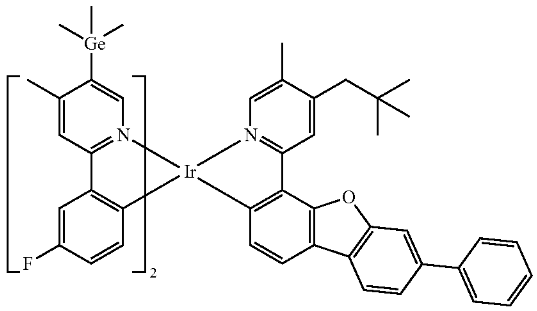
2218
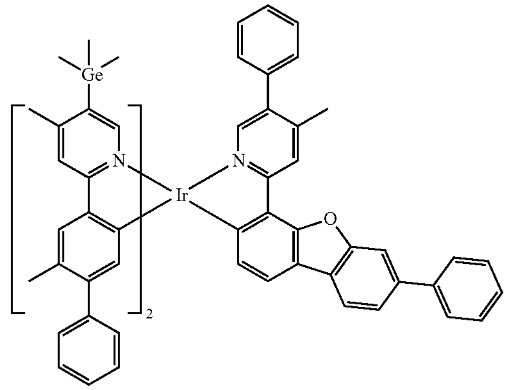
2219
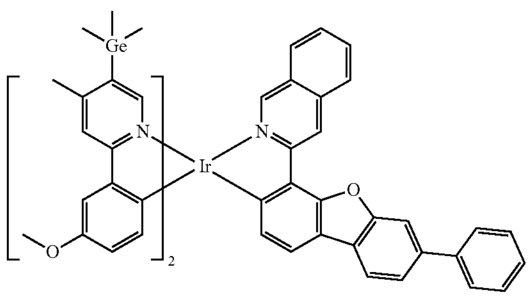
2220
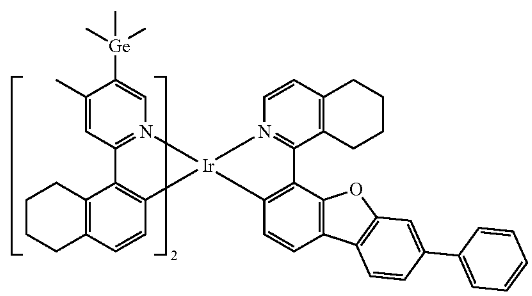
2221
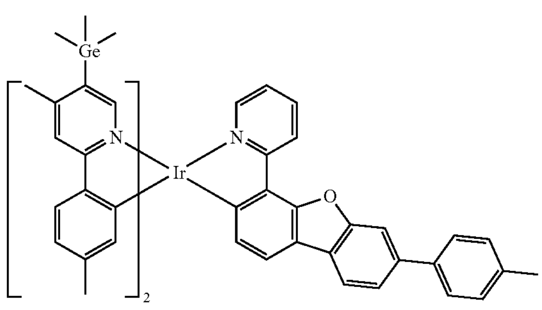
2222
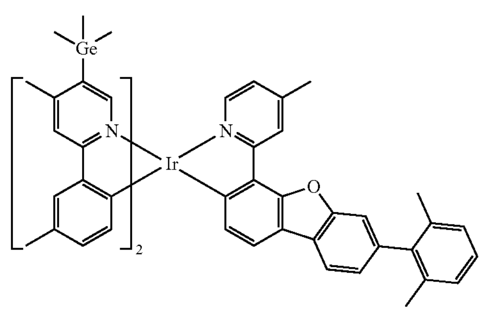
2223
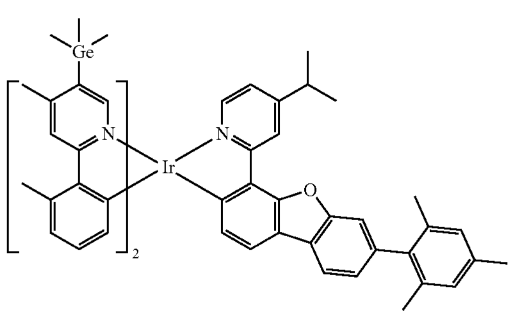
2224
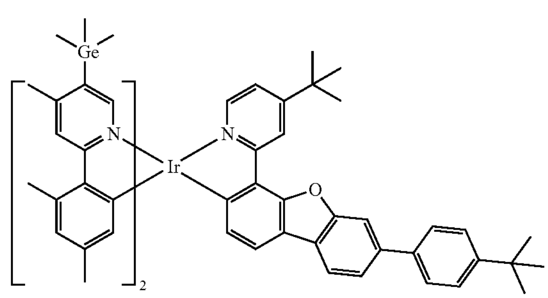

-continued
2225
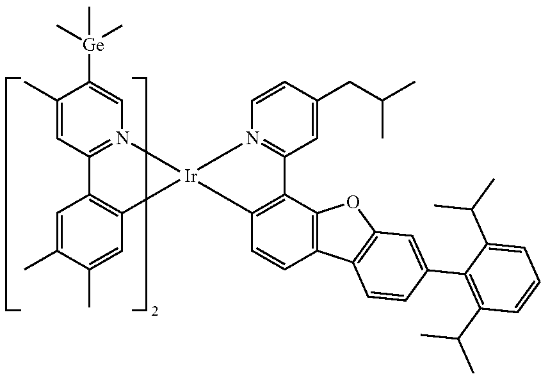
2226
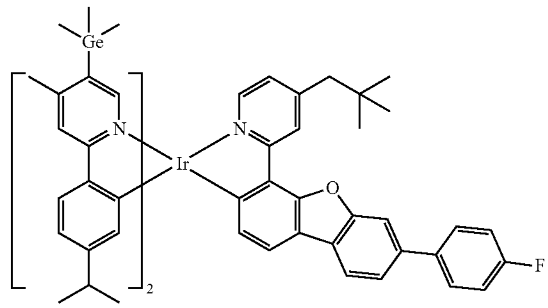
2227
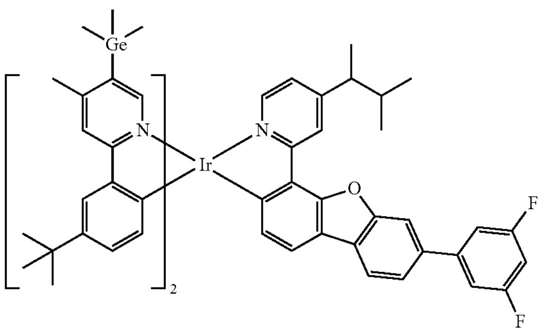
2228
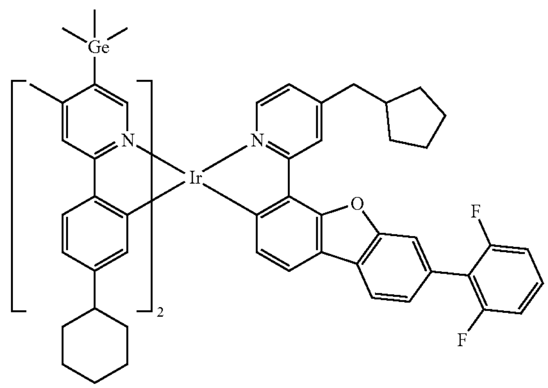
2229
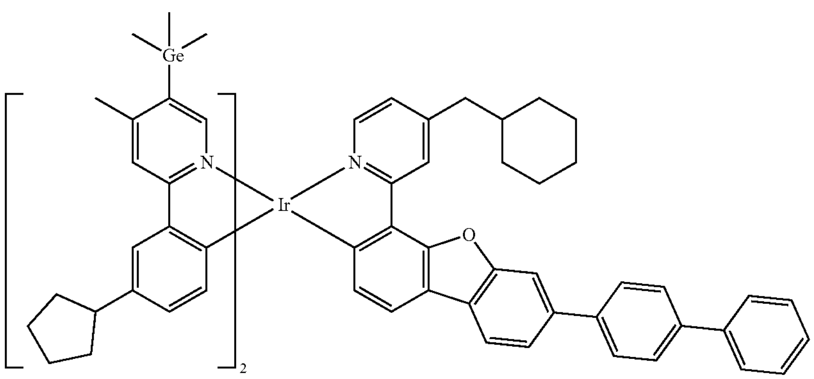
2230
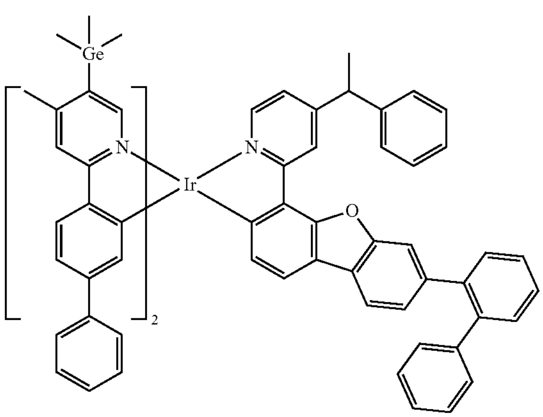
2231
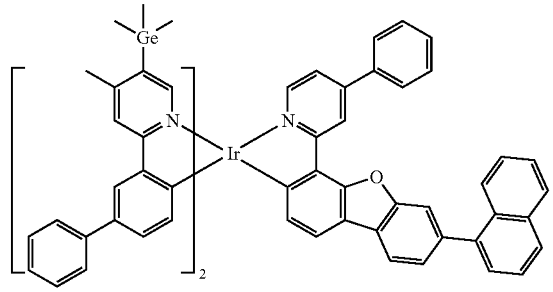

-continued
2232
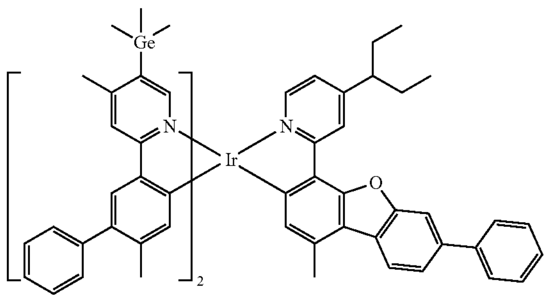
2233
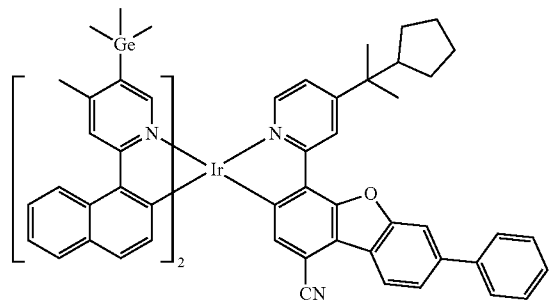
2234
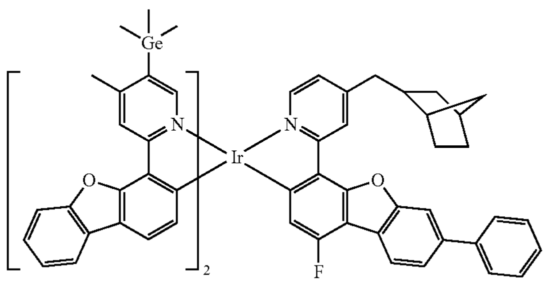
2235
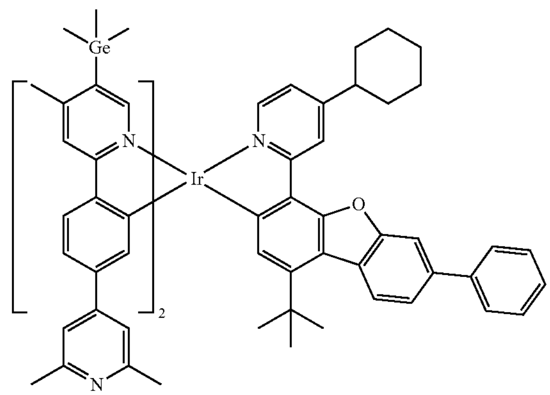
2236
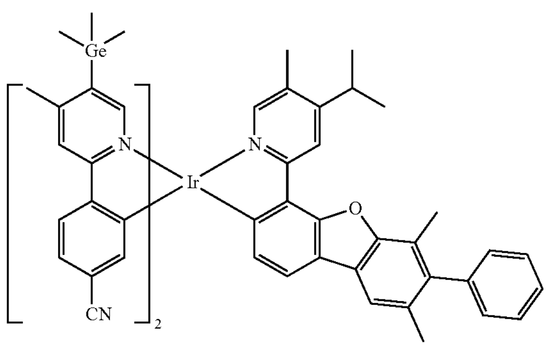
2237
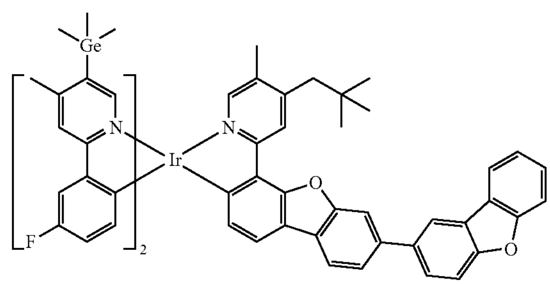
2238
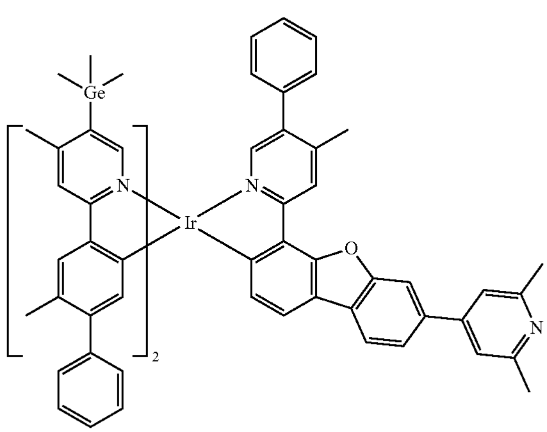
2239
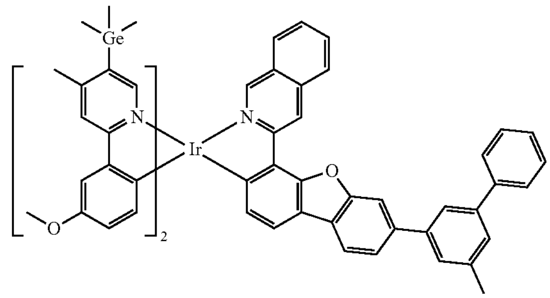

-continued
2240
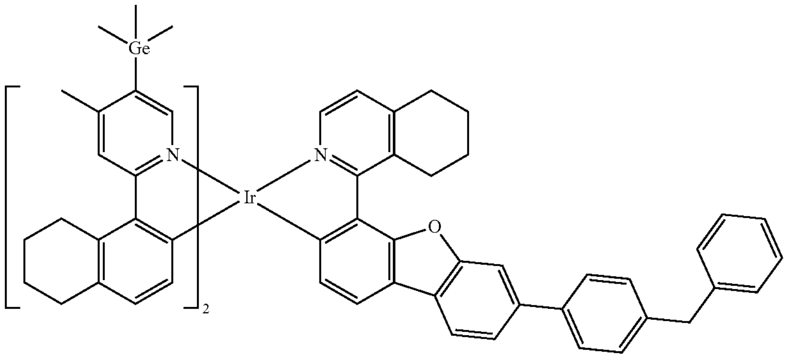
2241
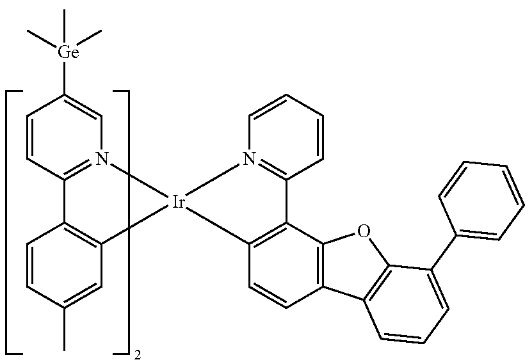
2242
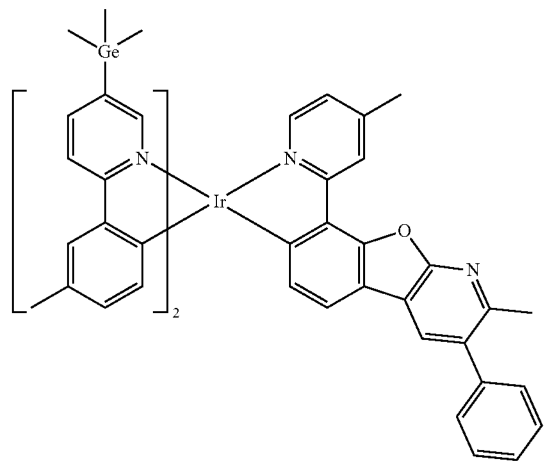
2243
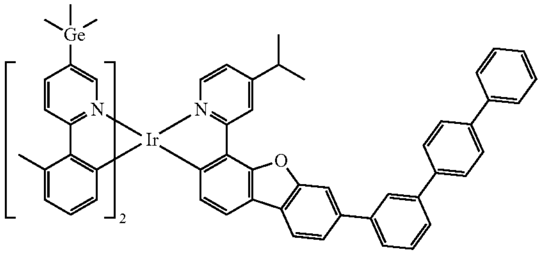
2244
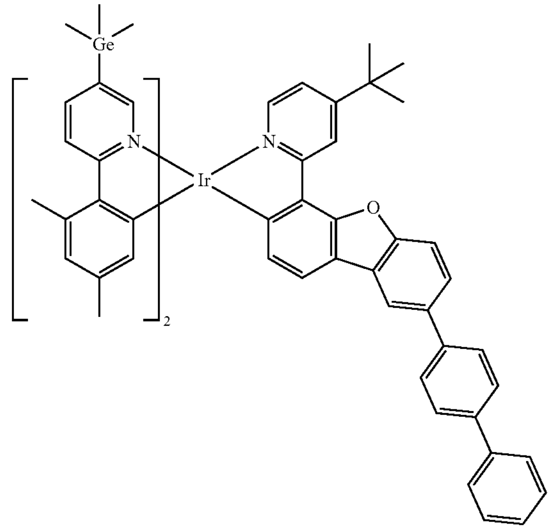

-continued
2245
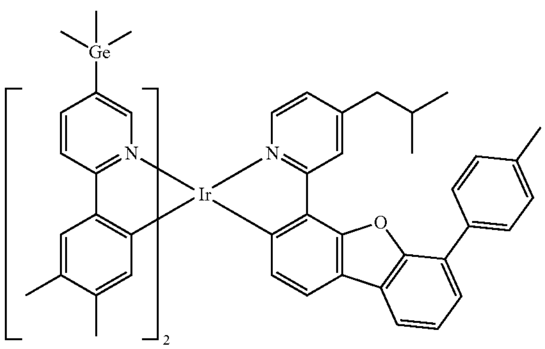
2246
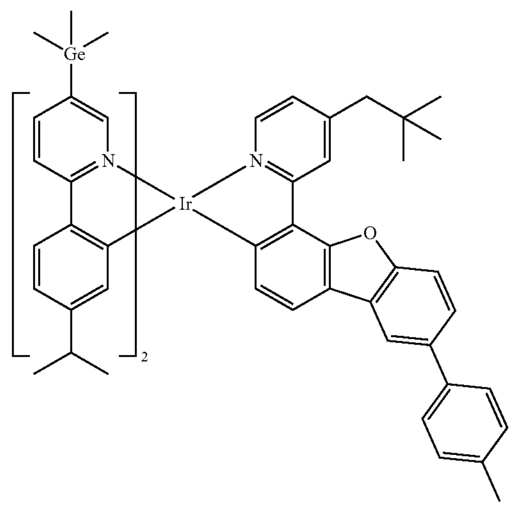
2247
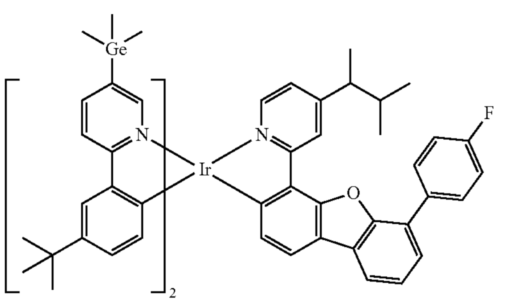
2248
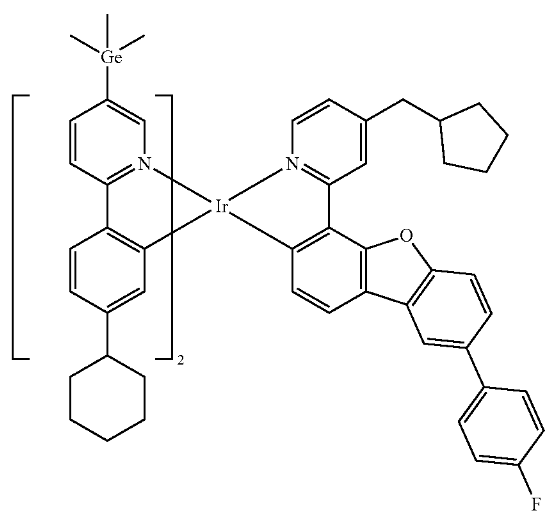
2249
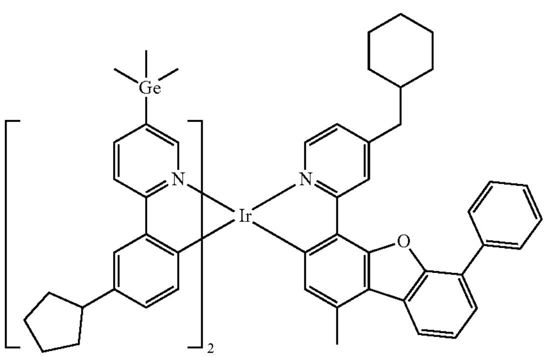
2250
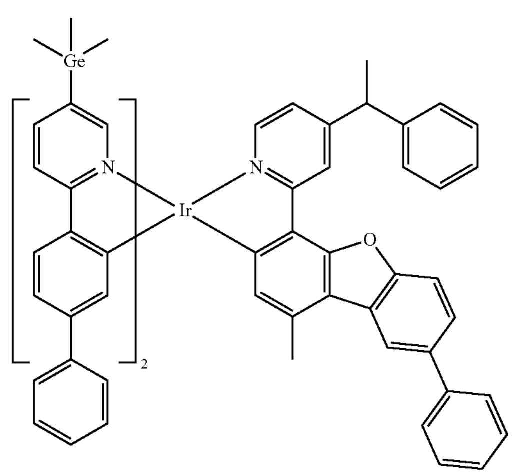

-continued
2251
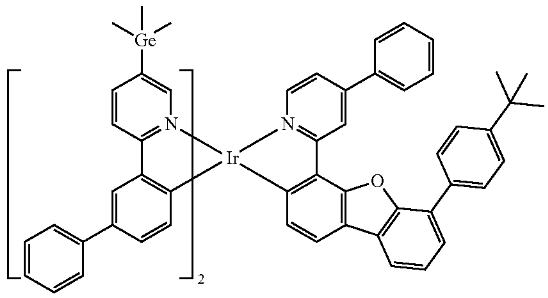
2252
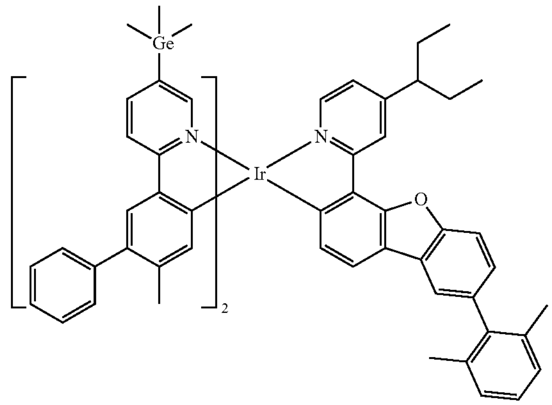
2253
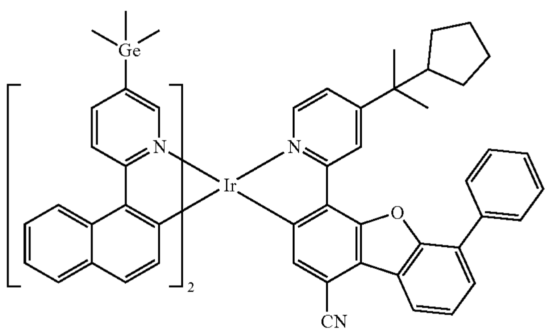
2254
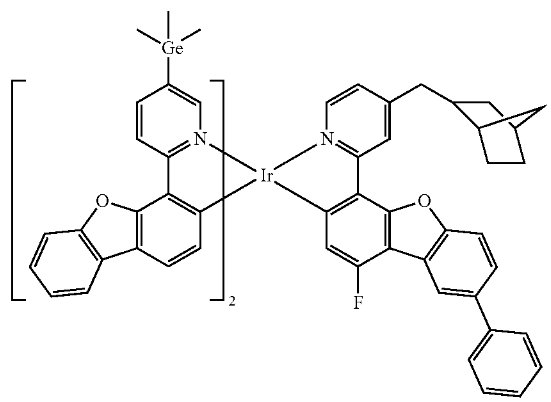
2255
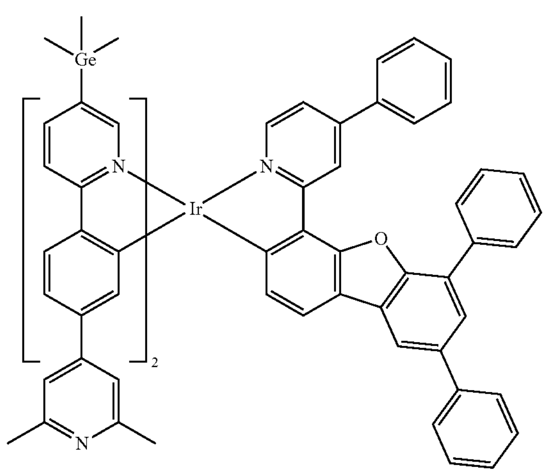
2256
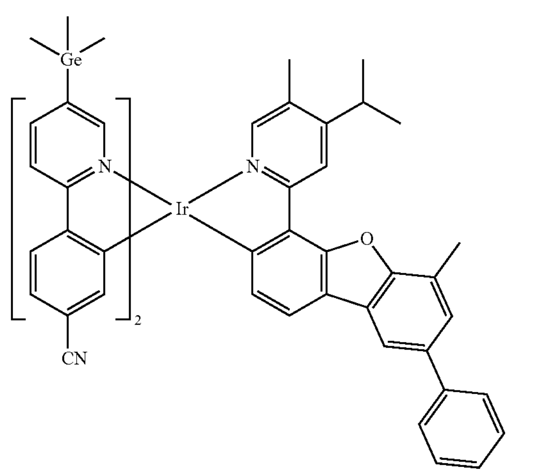

-continued
2257
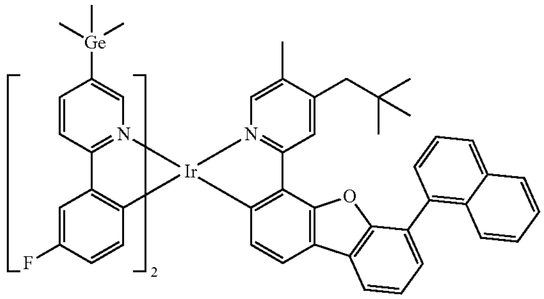
2258
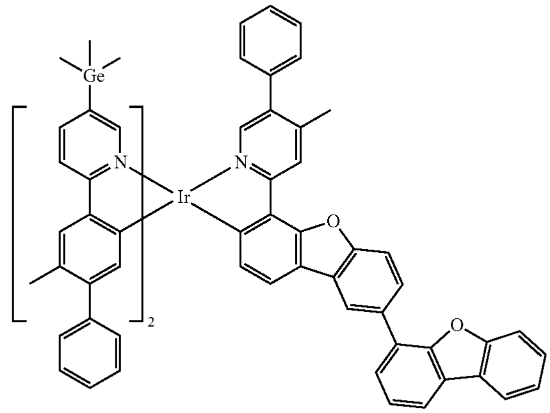
2259
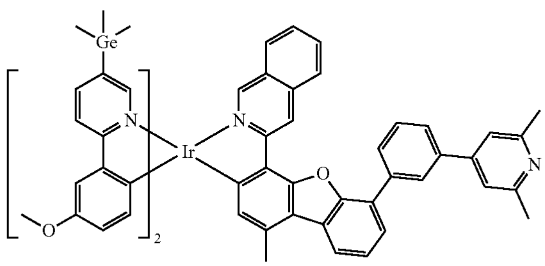
2260
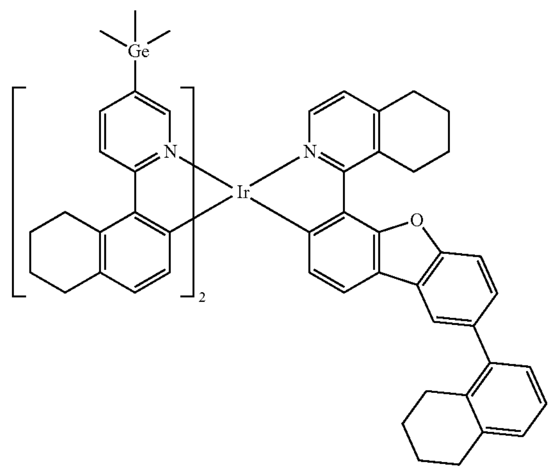
2261
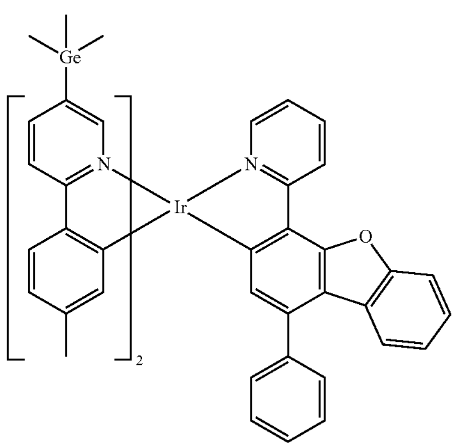
2262
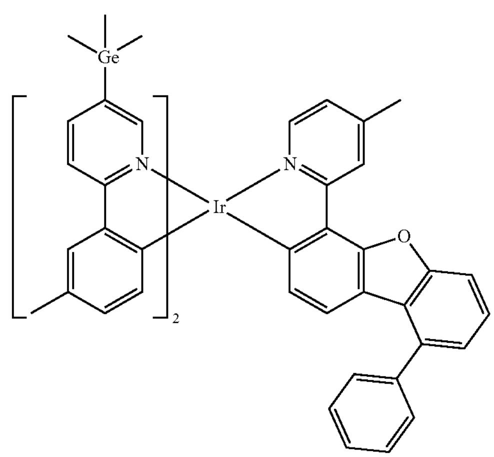

-continued
2263
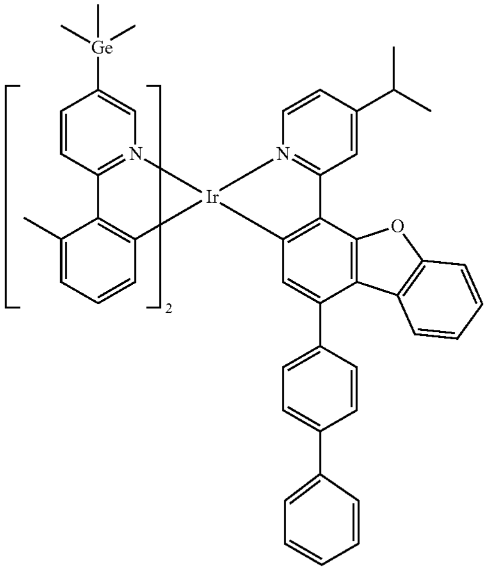
2264
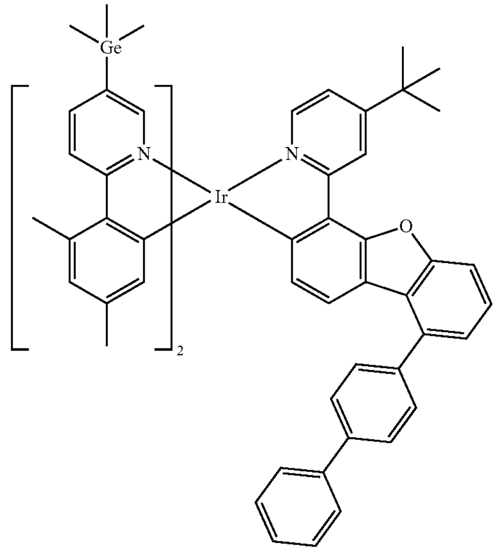
2265
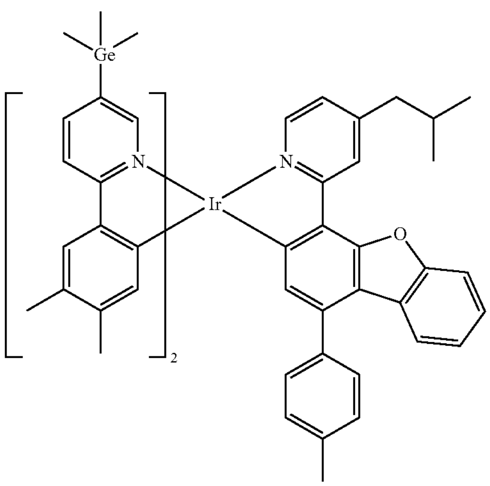
2266
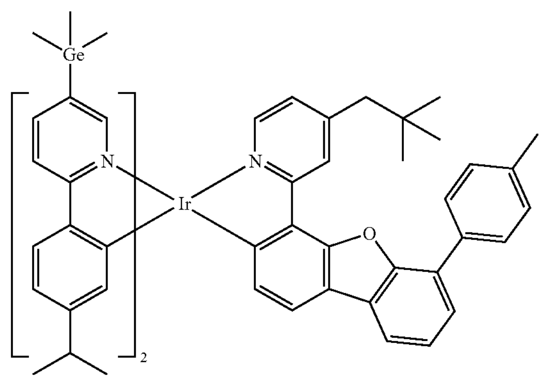
2267
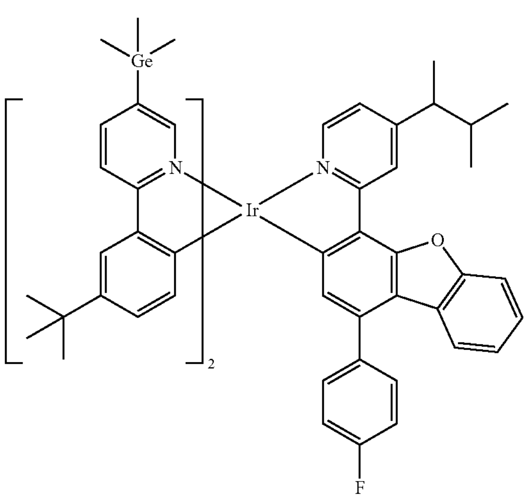
2268
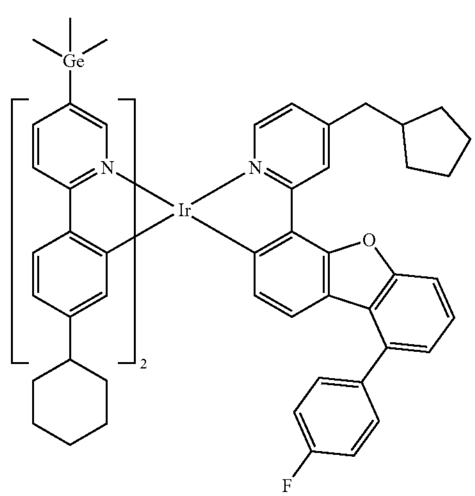

-continued
2269
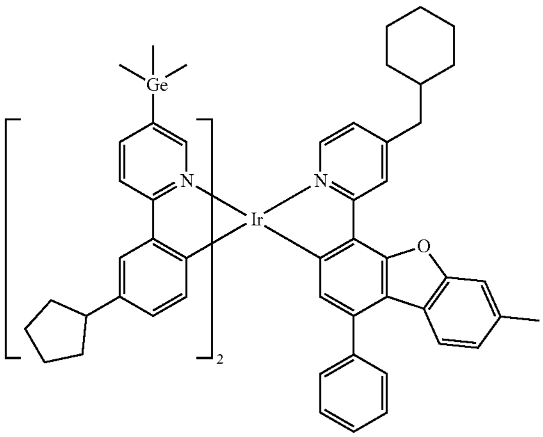
2270
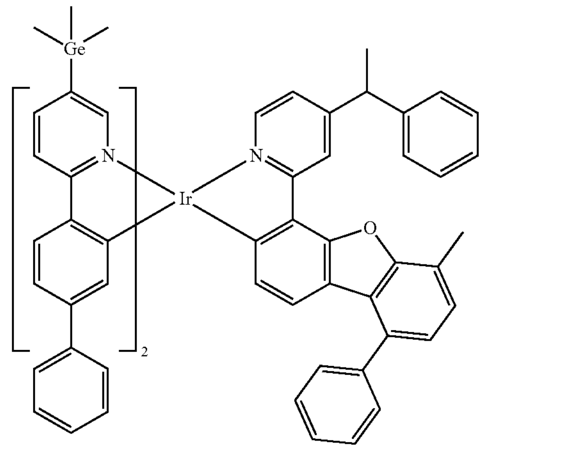
2271
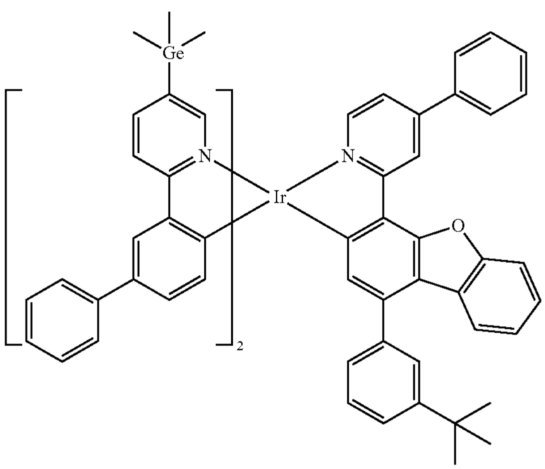
2272
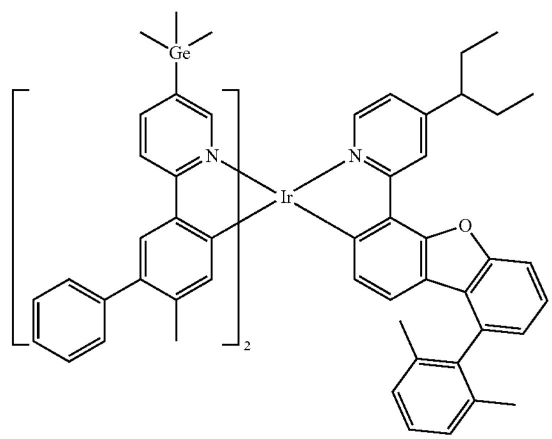
2273
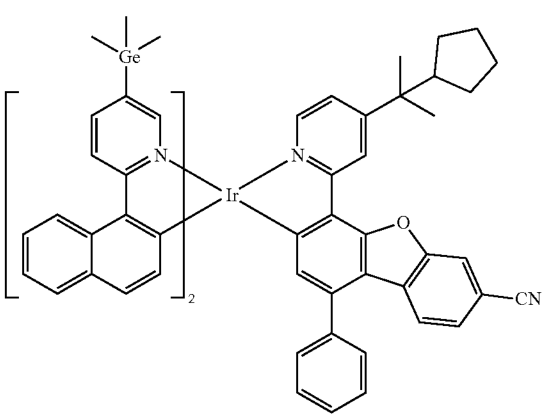
2274
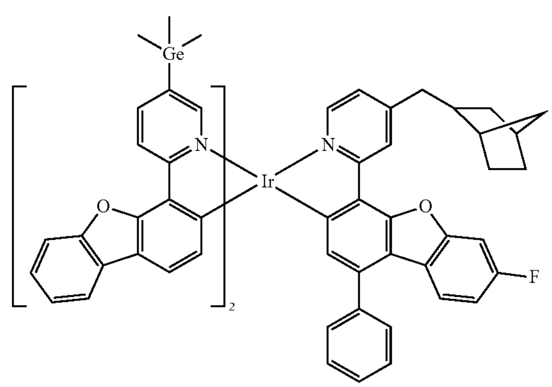

-continued
2275
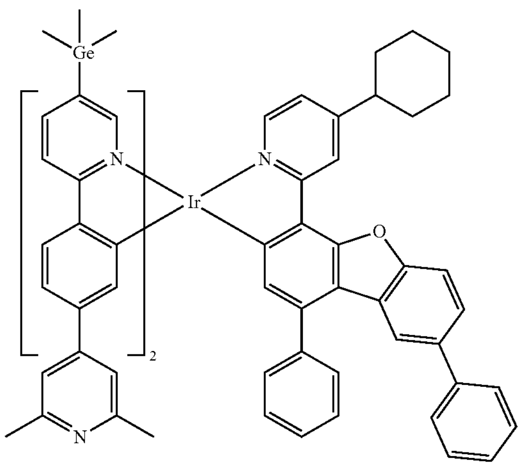
2276
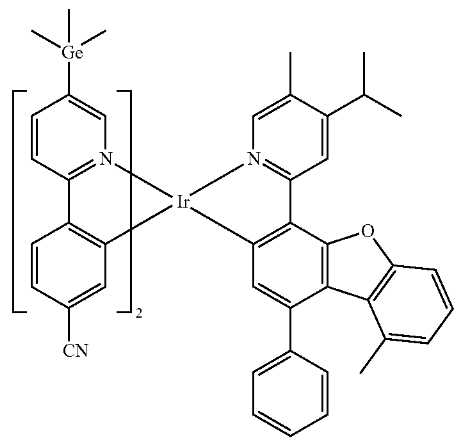
2277
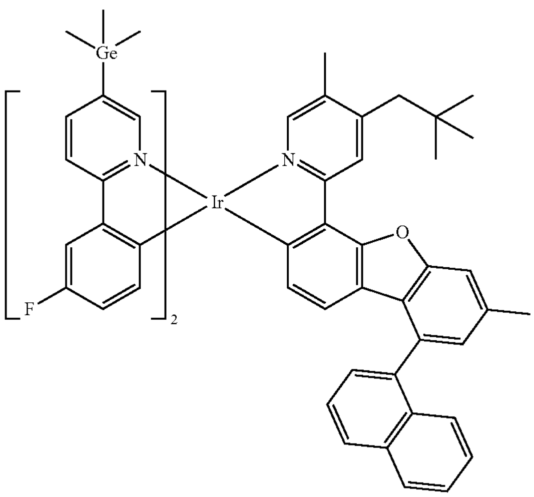
2278
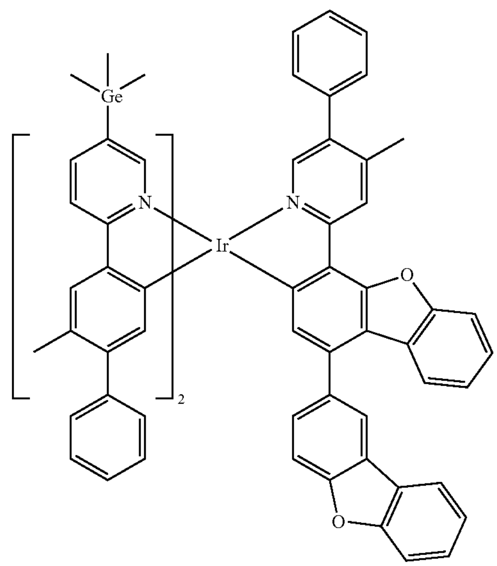
2279
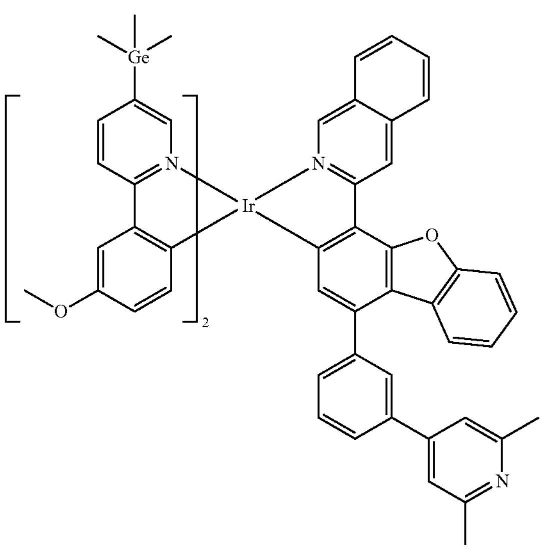
2280
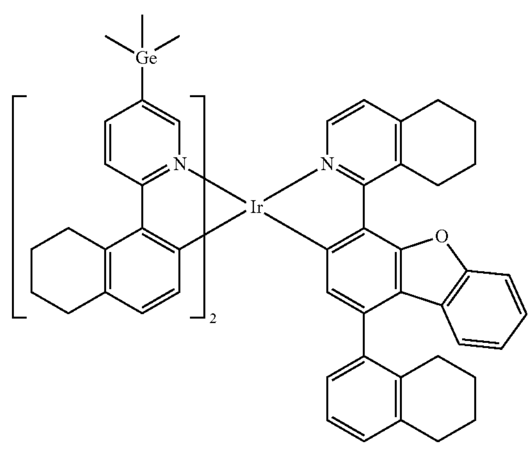

-continued
2281
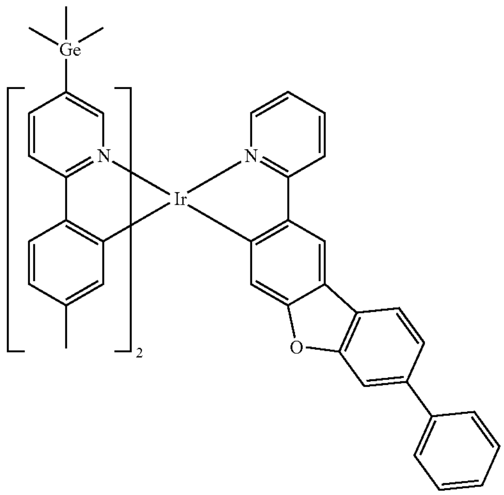
2282
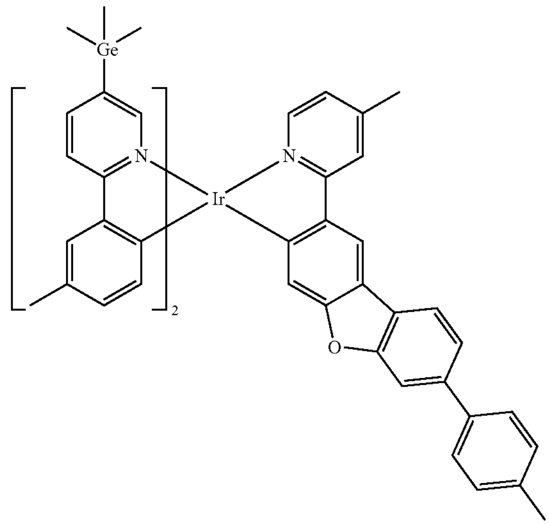
2283
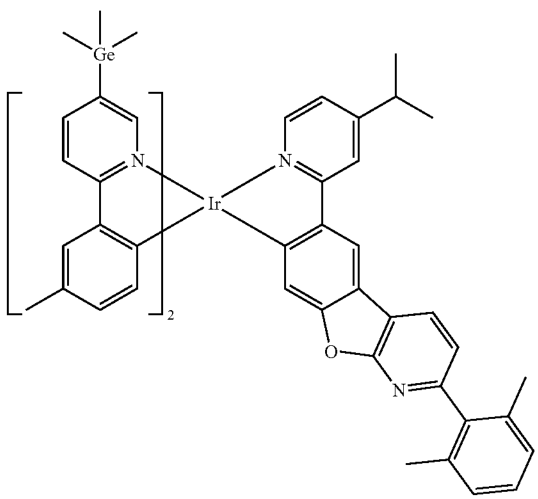
2284
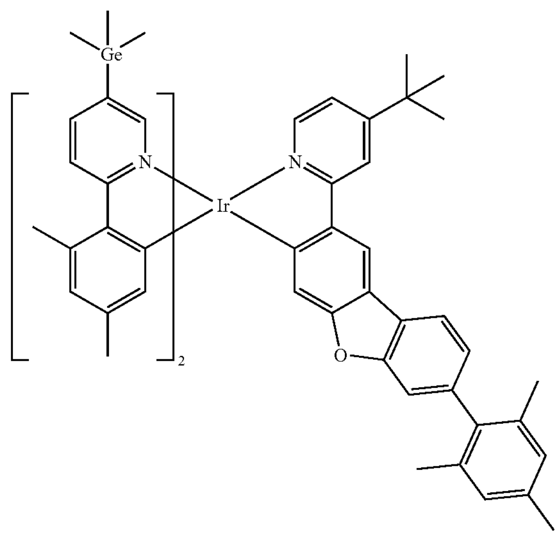
2285
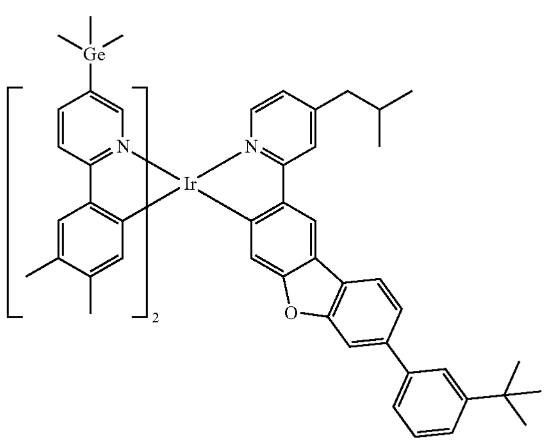
2286
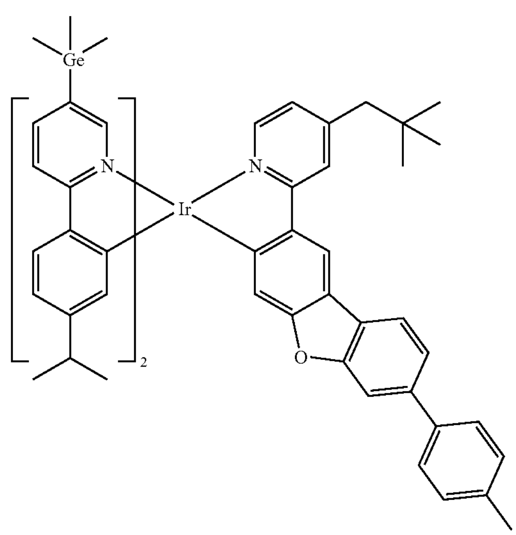

-continued
2287
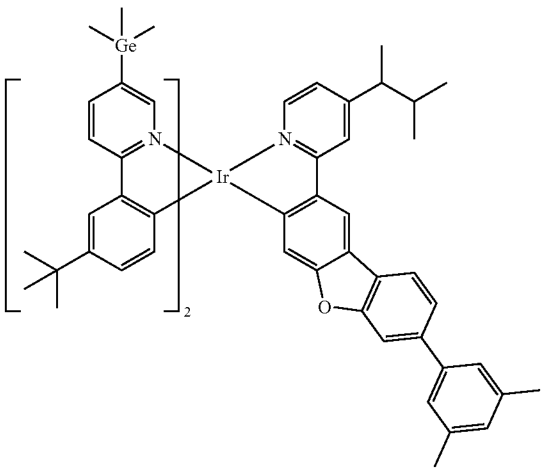
2288
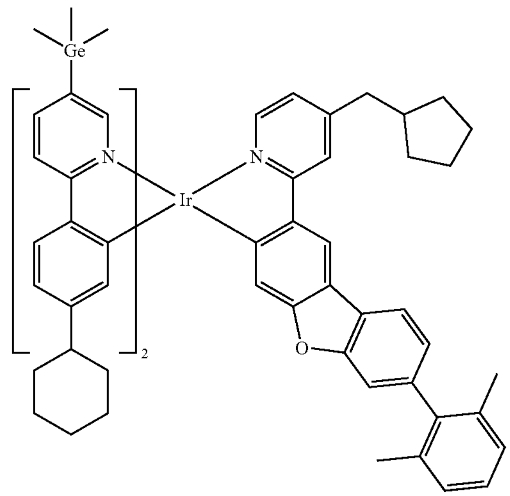
2289
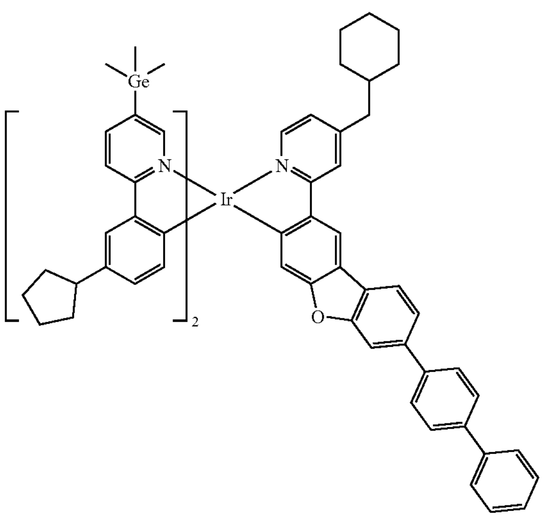
2290
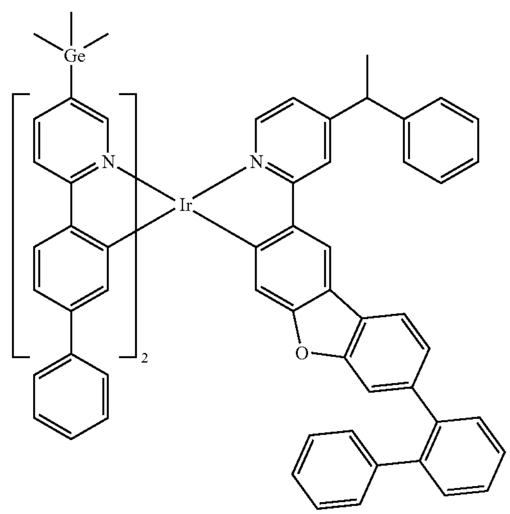
2291
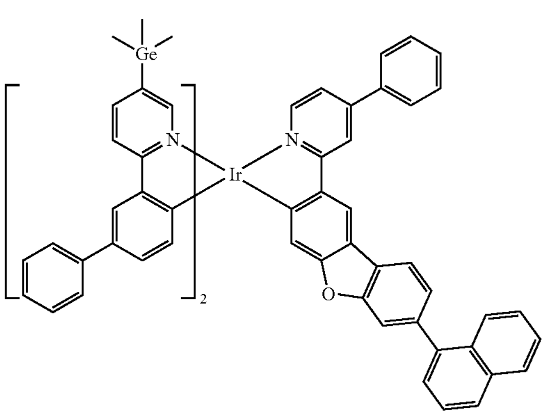
2292
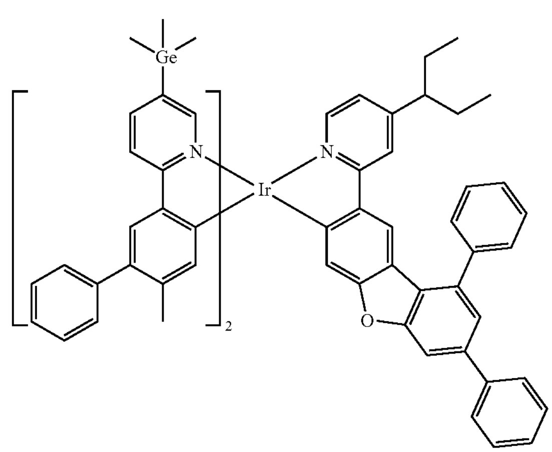

-continued
2293
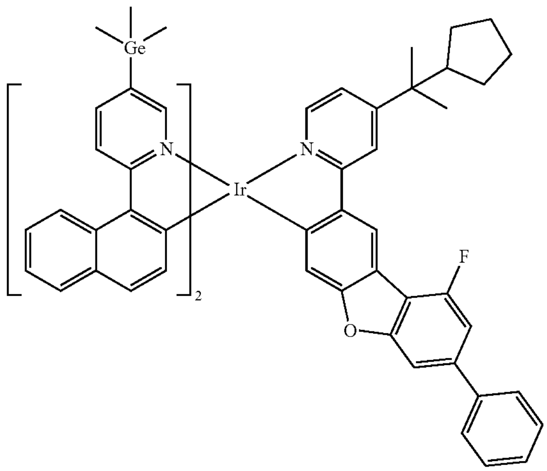
2294
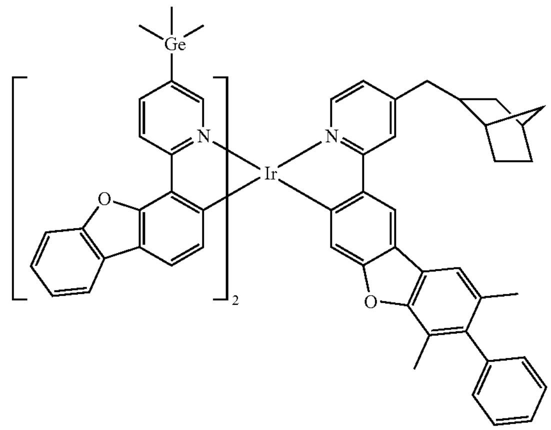
2295
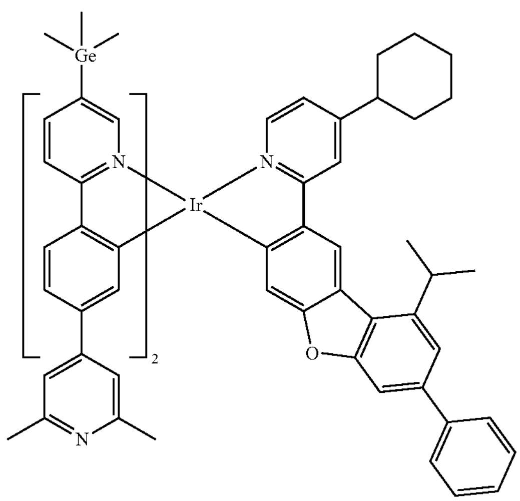
2296
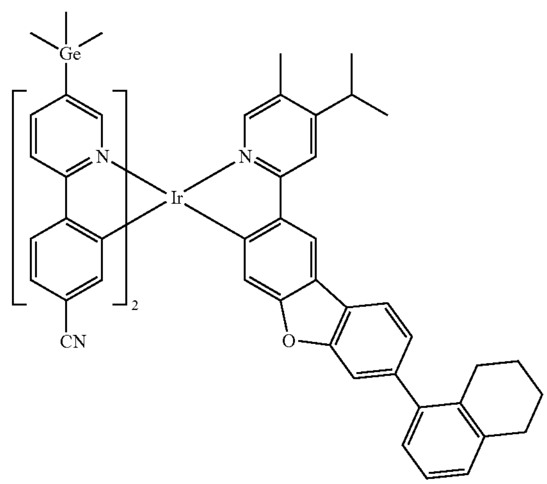
2297
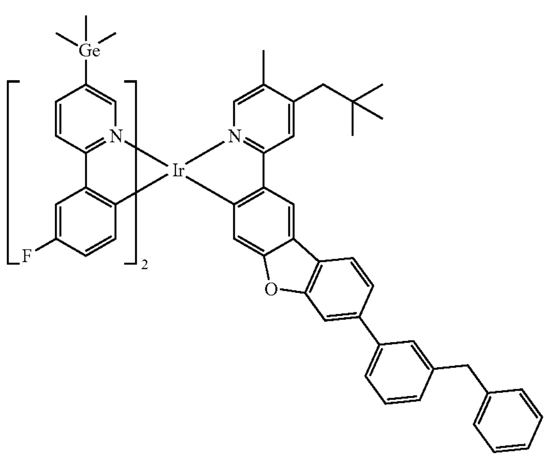
2298
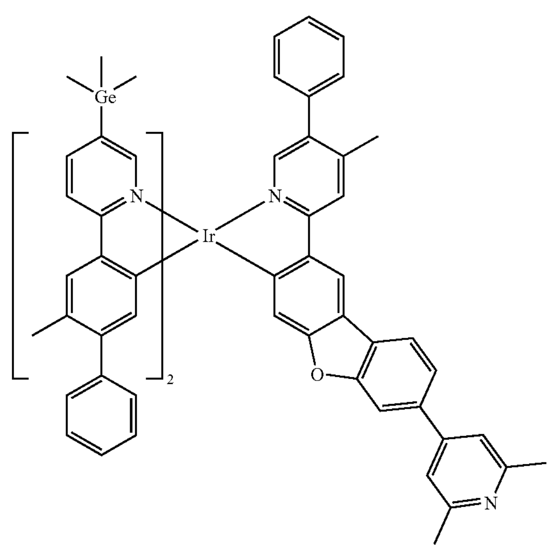

-continued
2299
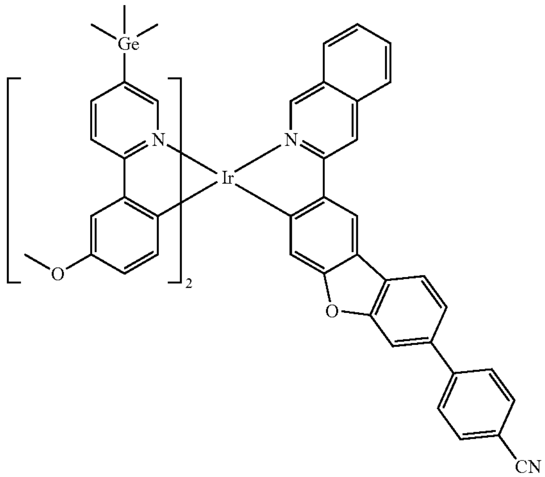
2300
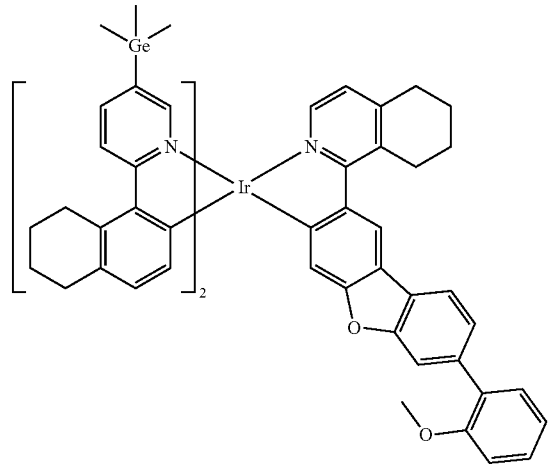
2301
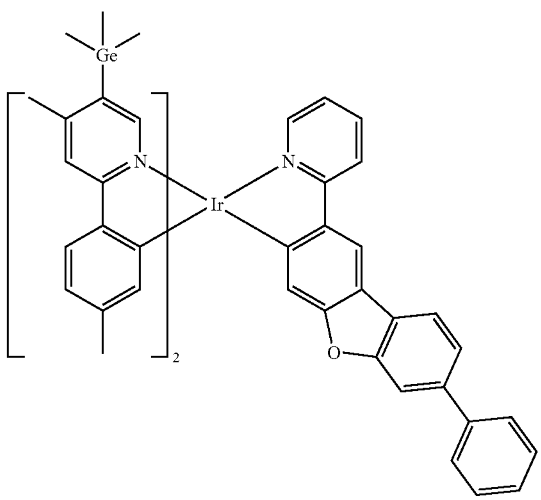
2302
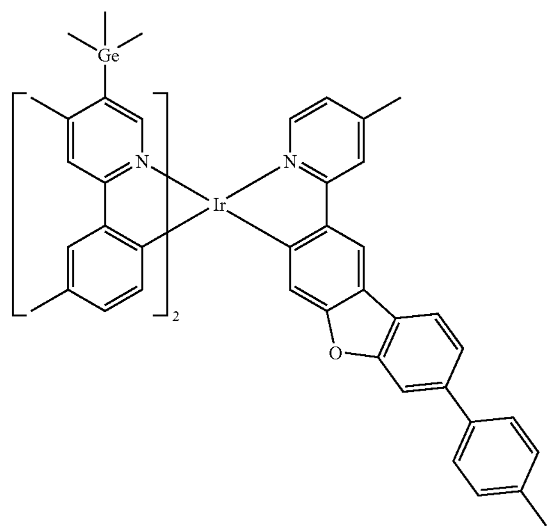
2303
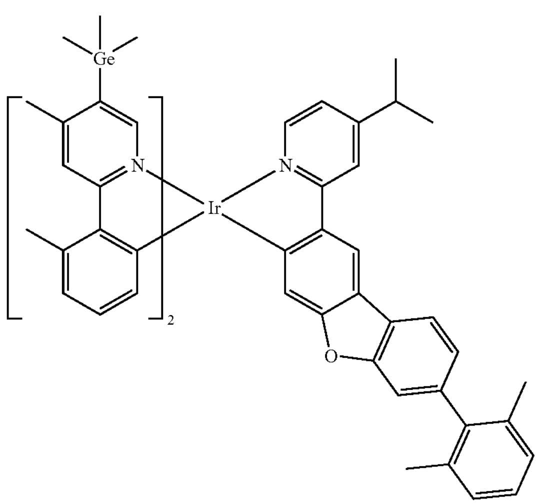
2304
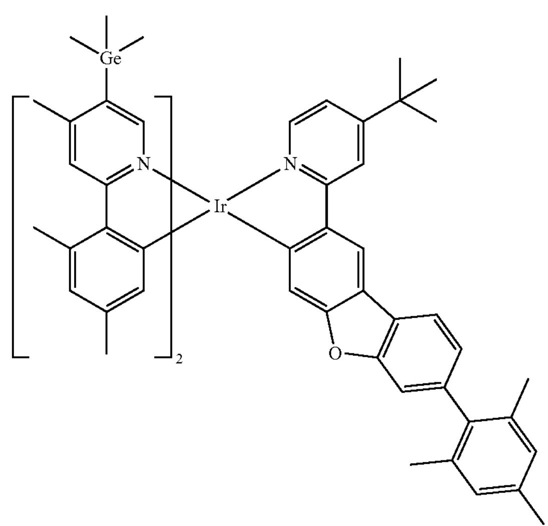

-continued
2305
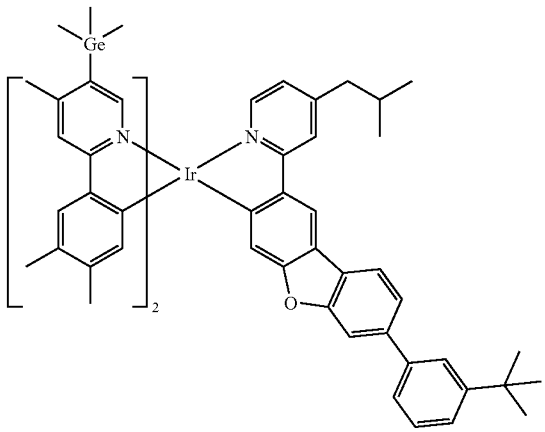
2306
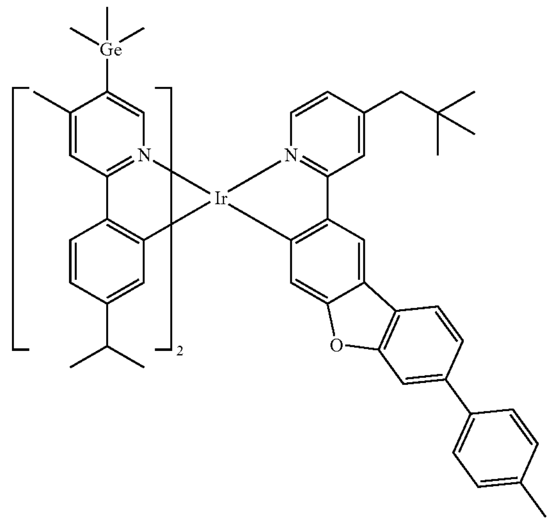
2307
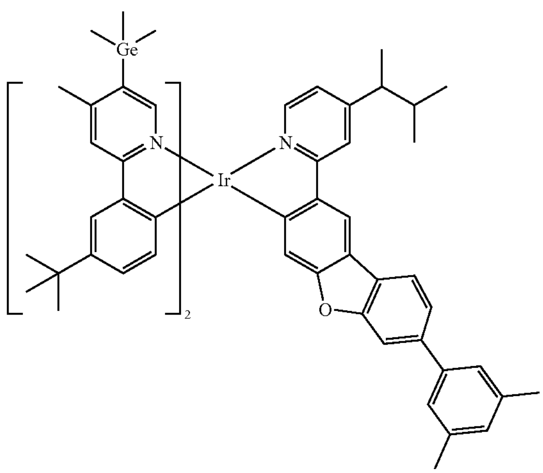
2308
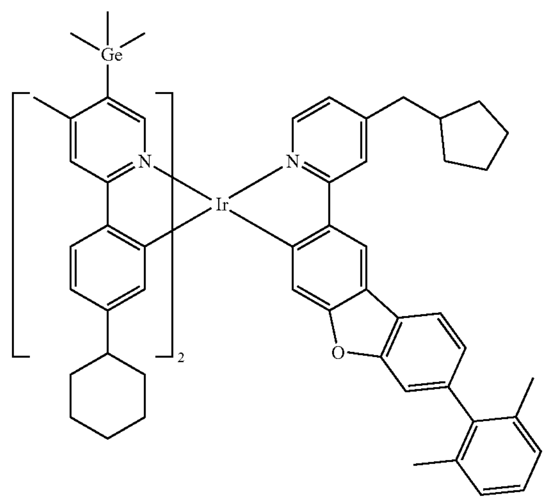
2309
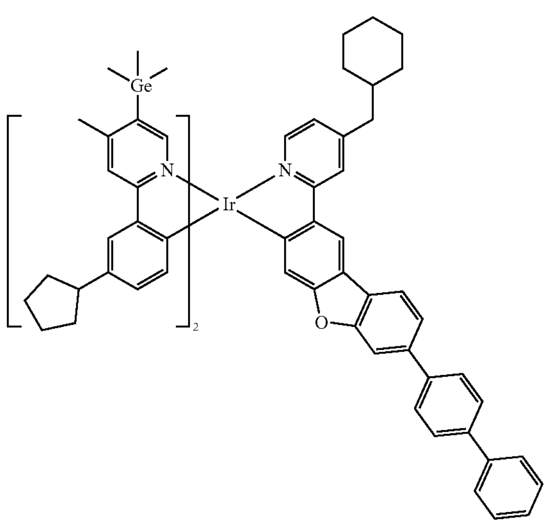
2310
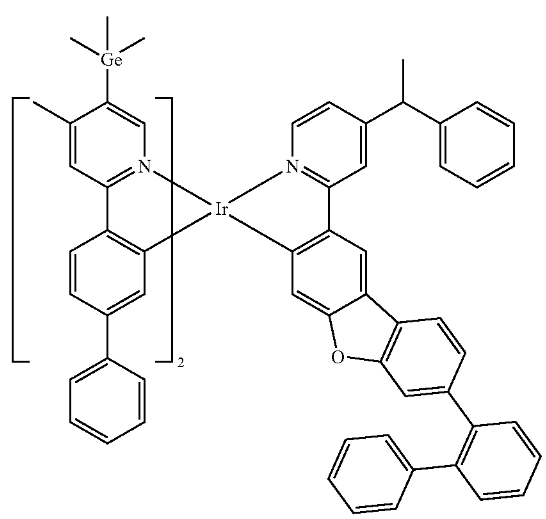

-continued
2311
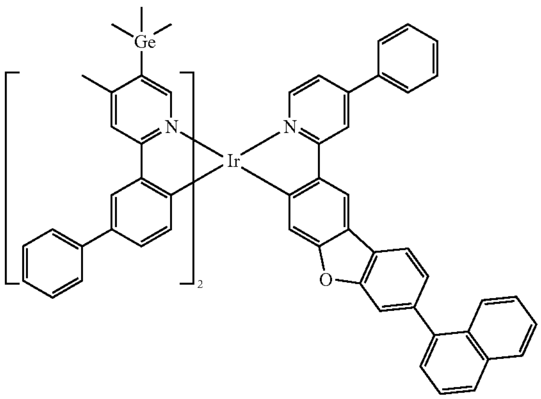
2312
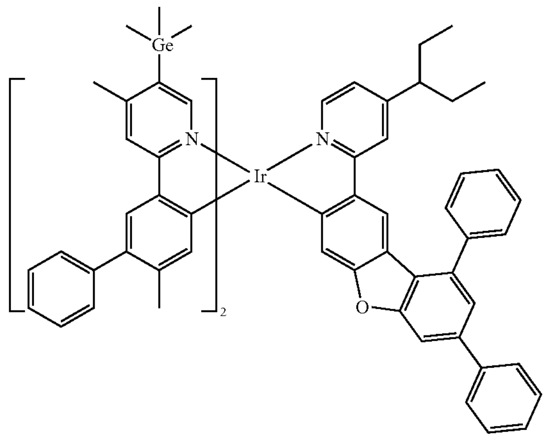
2313
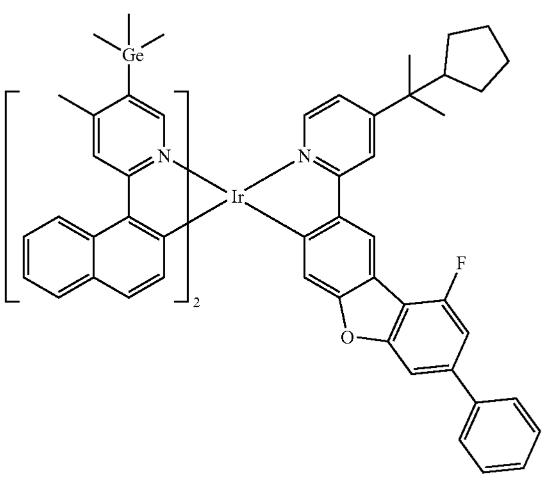
2314
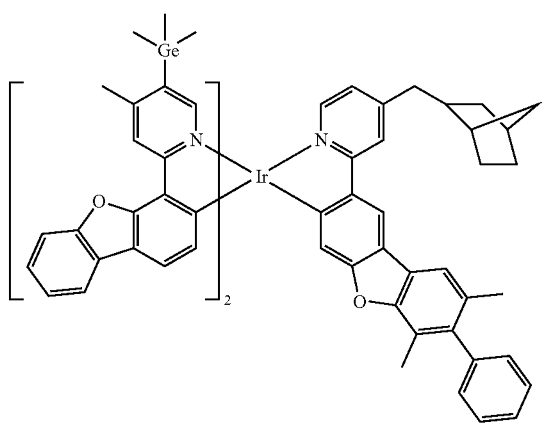
2315
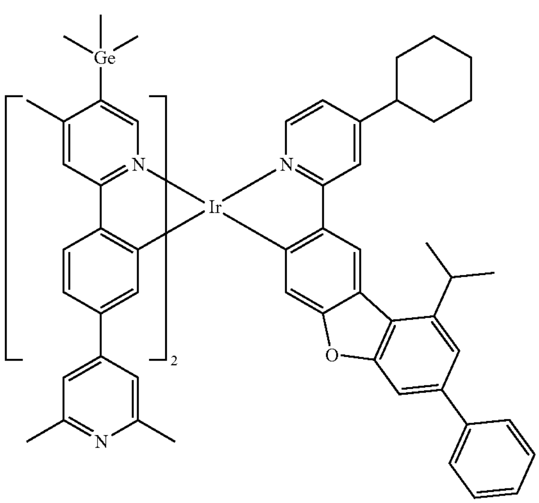
2316
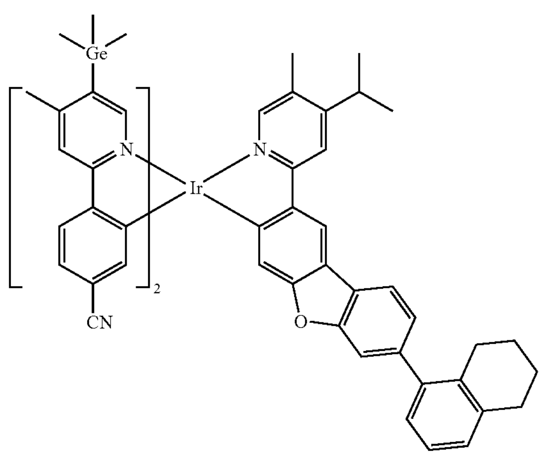

-continued
2317
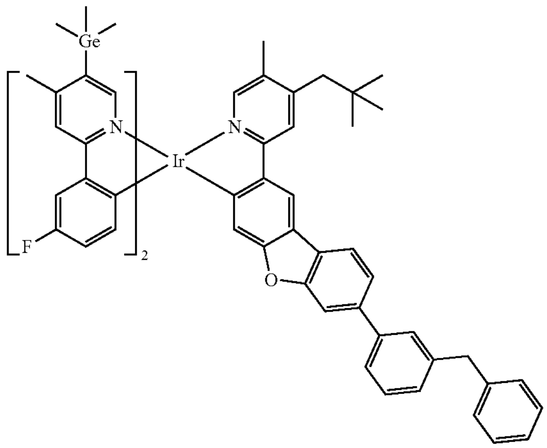
2318
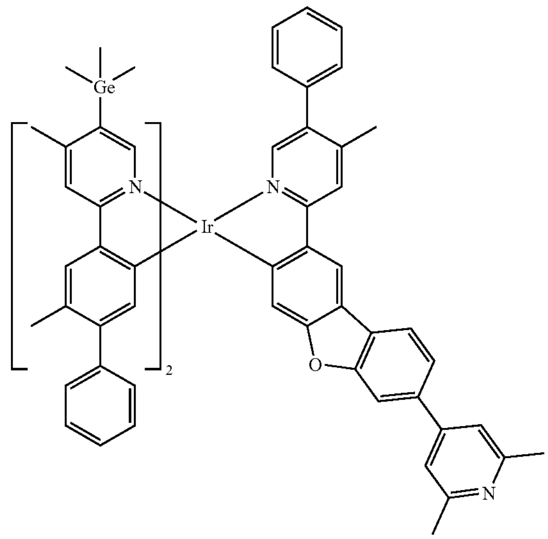
2319
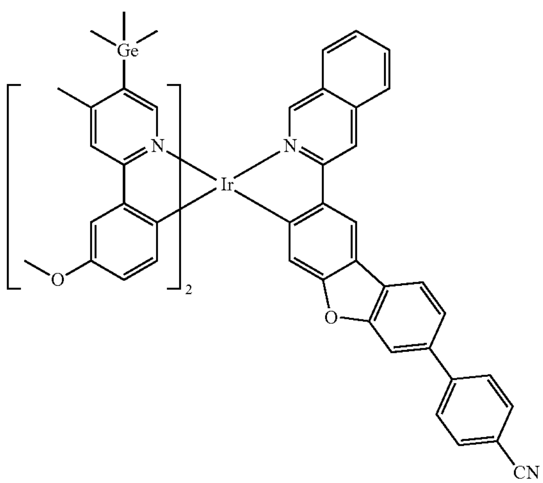
2320
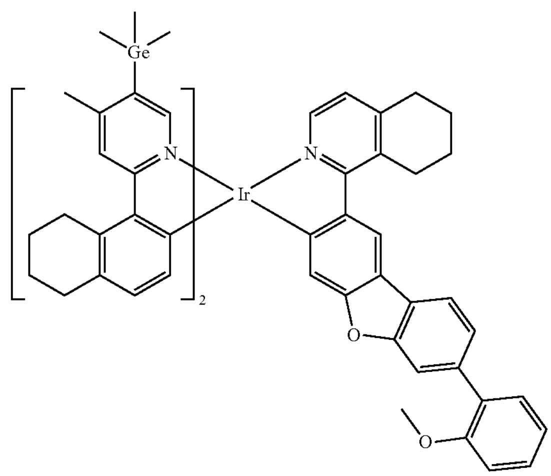
2321
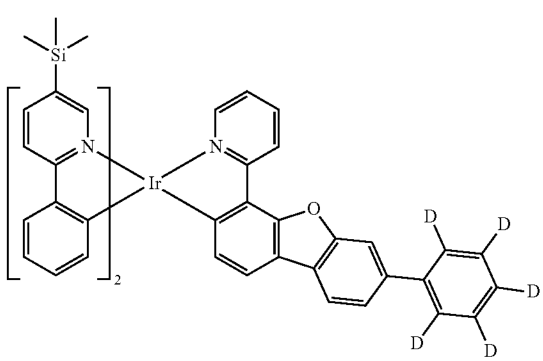
2322
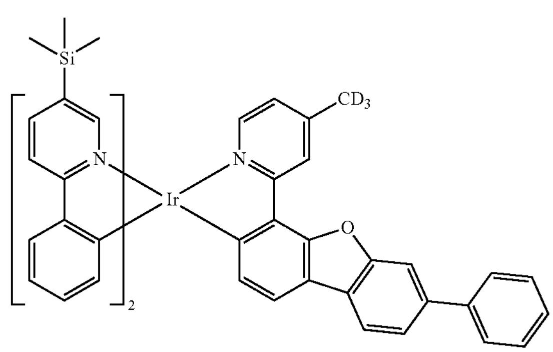

-continued
2323
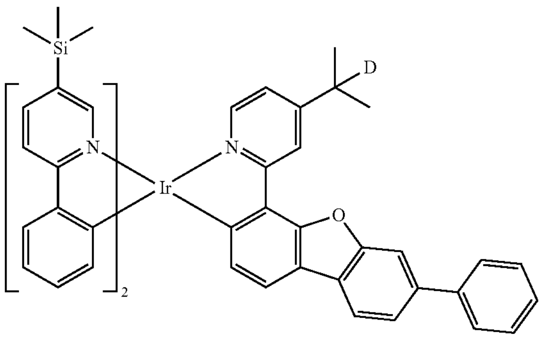
2324
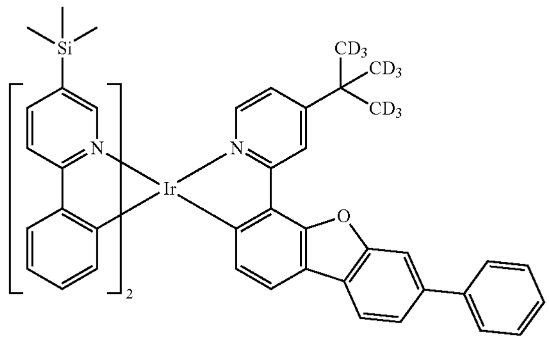
2325
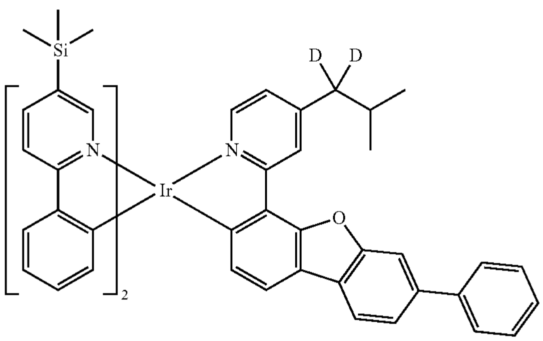
2326
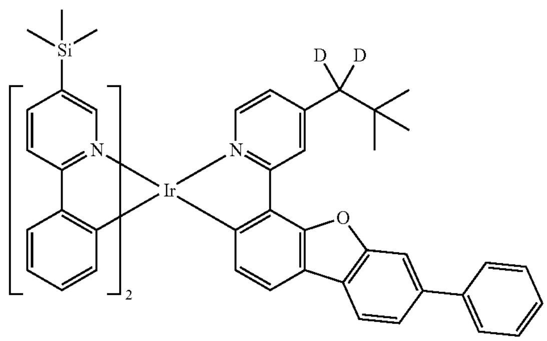
2327
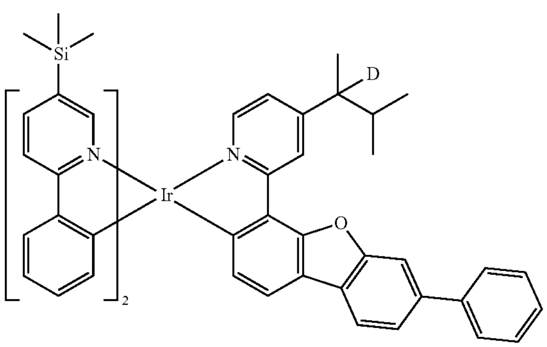
2328
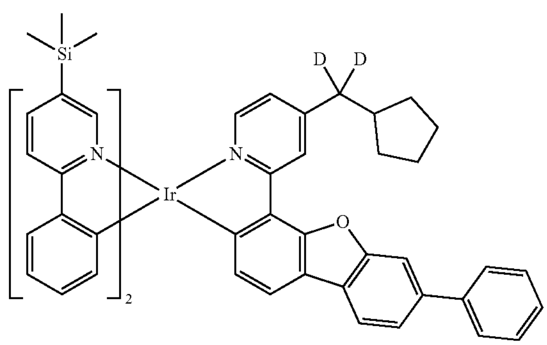
2329
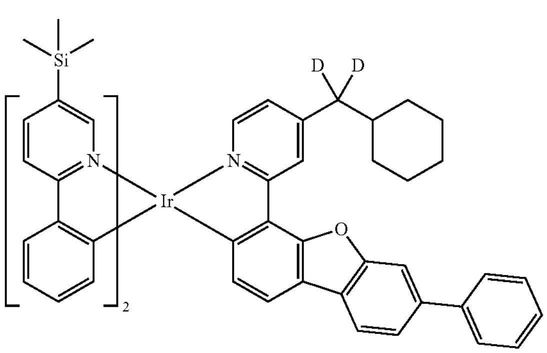
2330
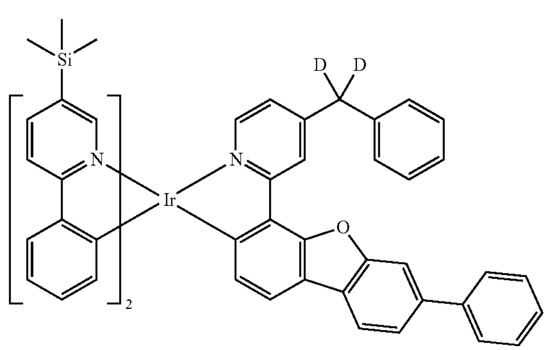

-continued
2331
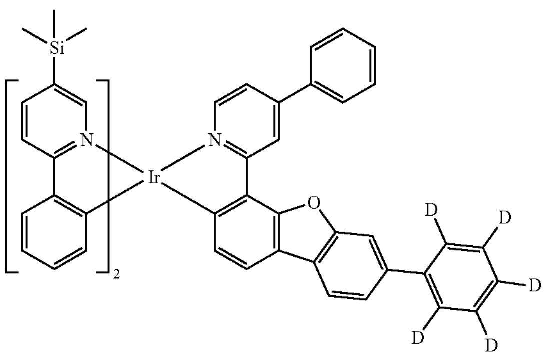
2332
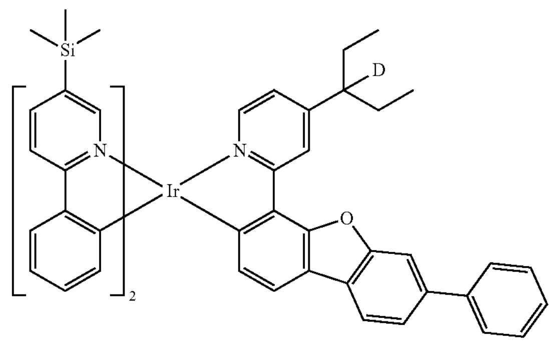
2333
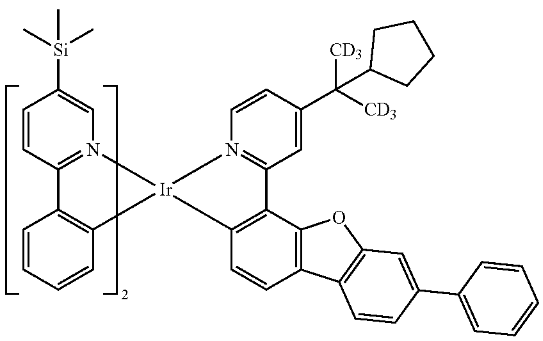
2334
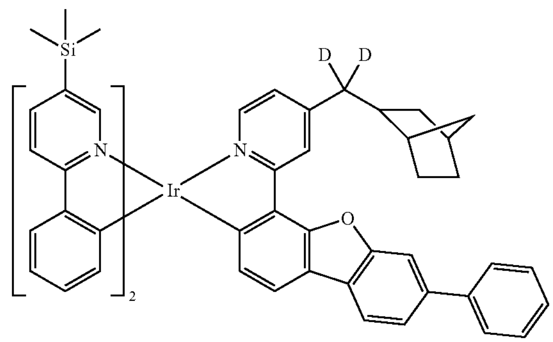
2335
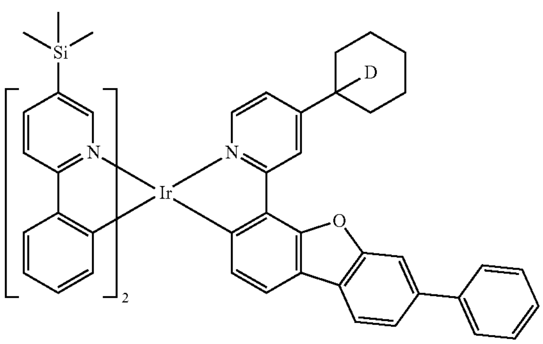
2336
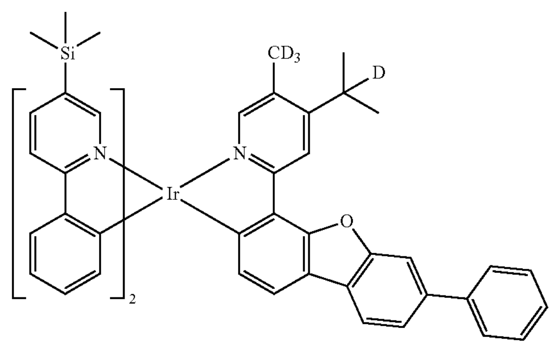
2337
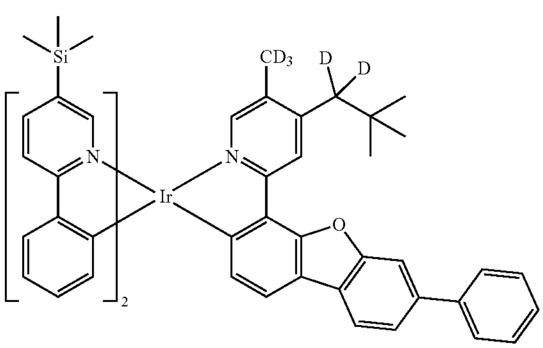
2338
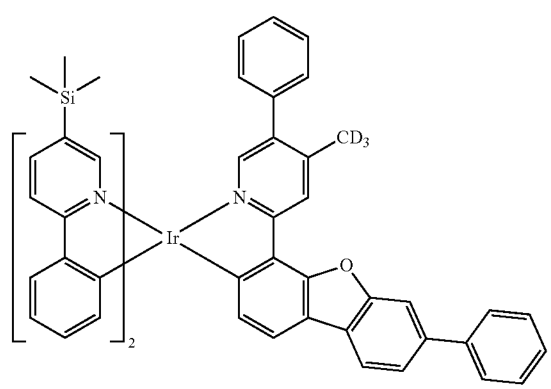

-continued
2339
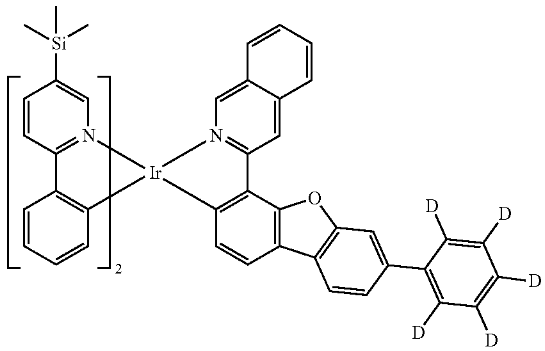
2340
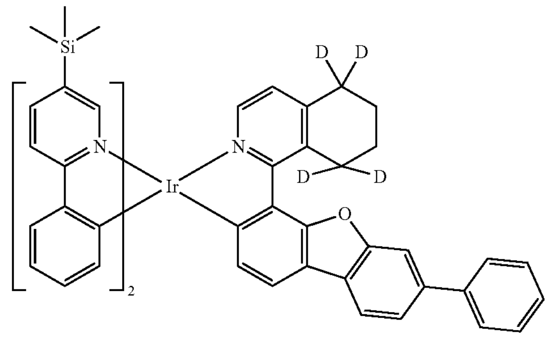
2341
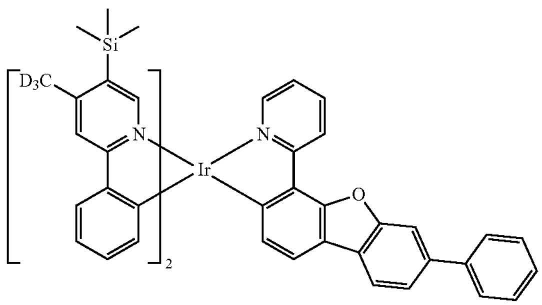
2342
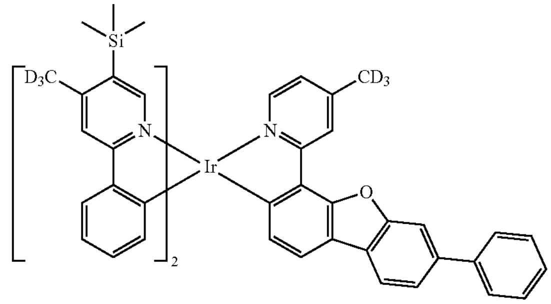
2343
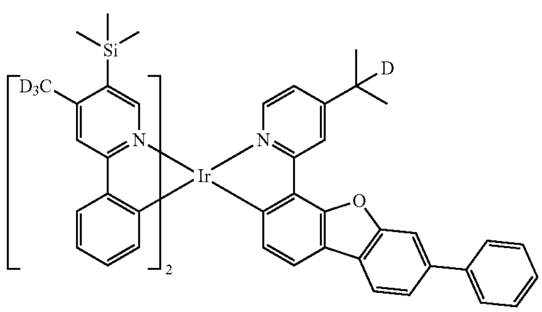
2344
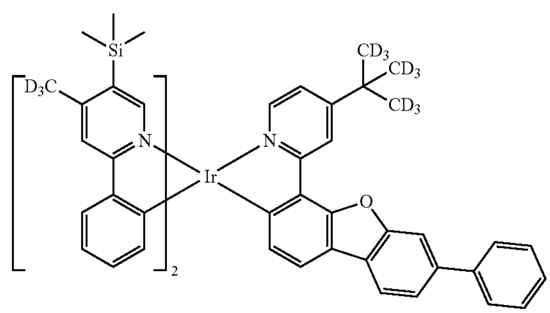
2345
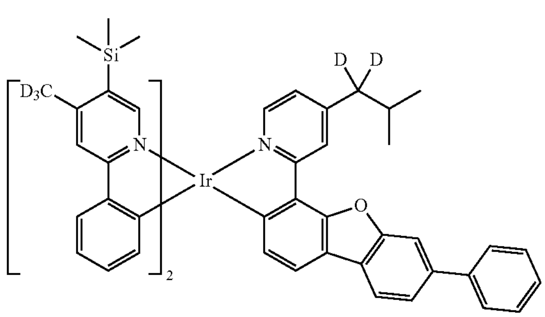
2346
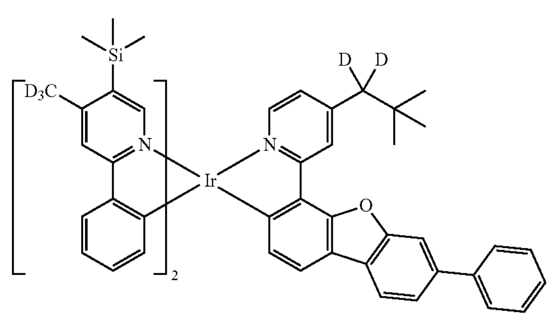

-continued
2347
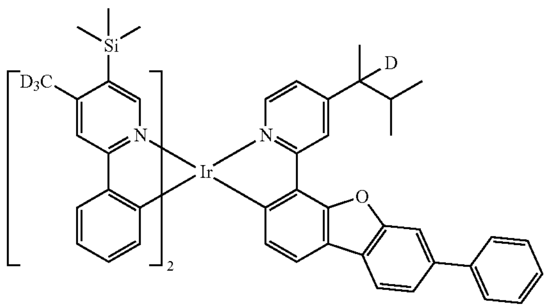
2348
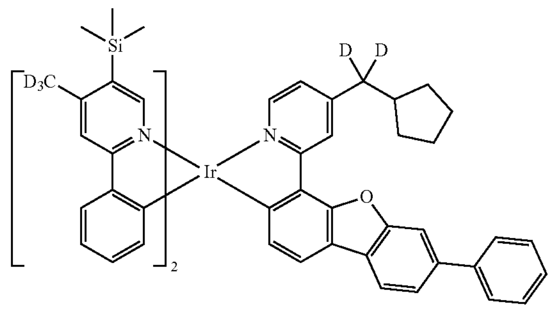
2349
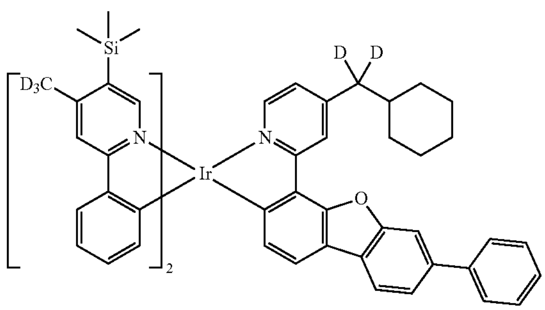
2350
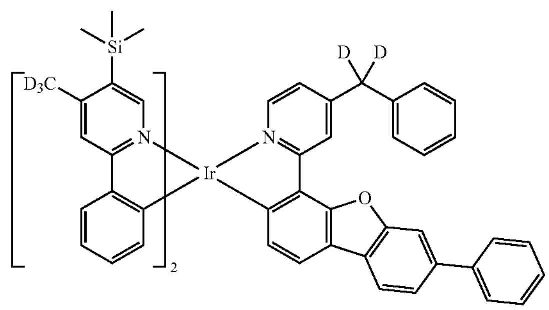
2351
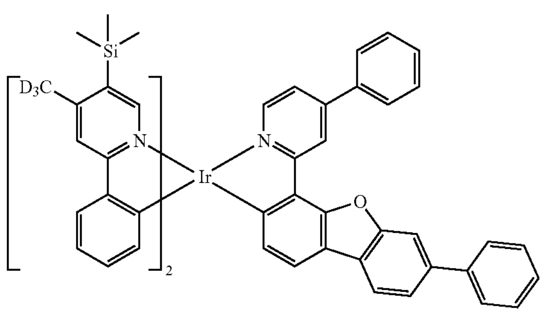
2352
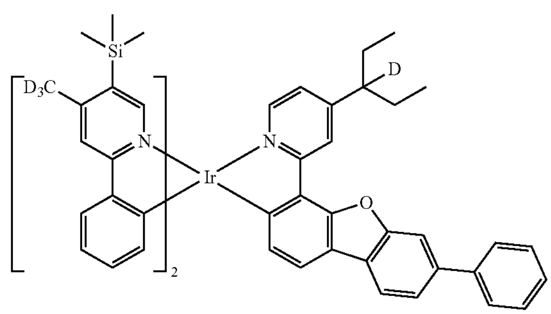
2353
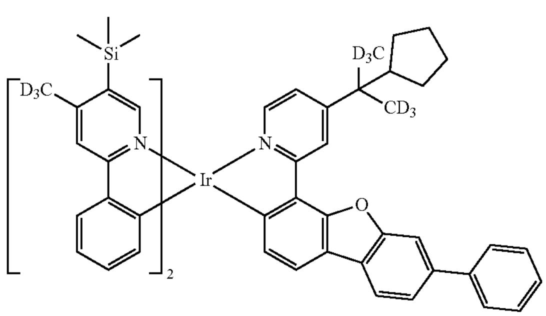
2354
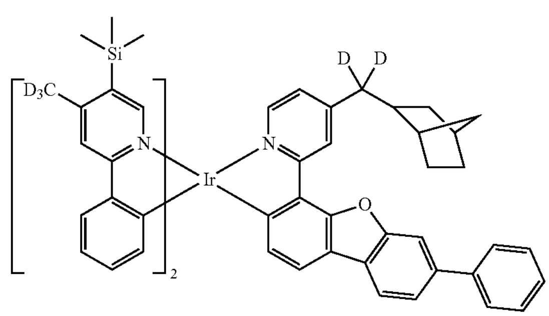
2355
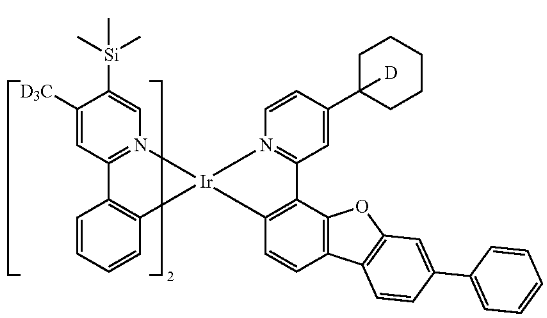
2356
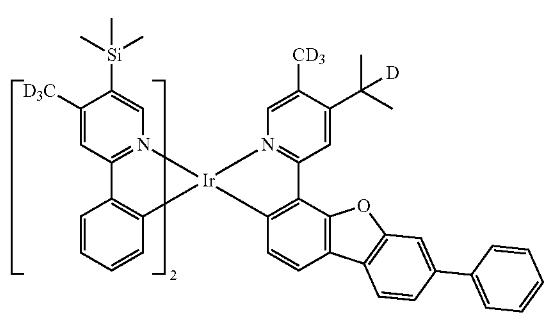

-continued
2357
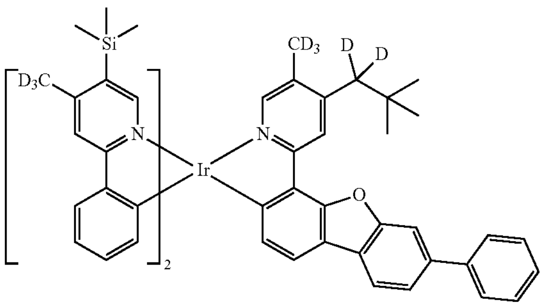
2358
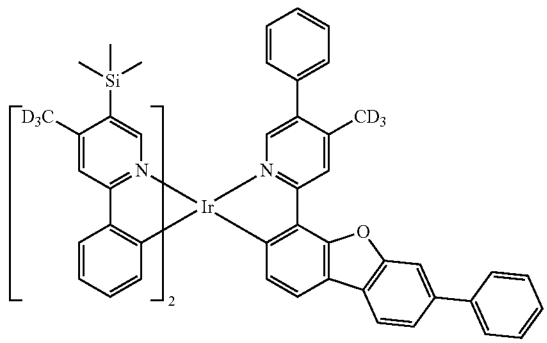
2359
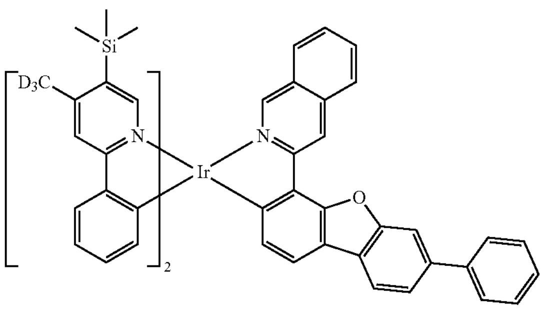
2360
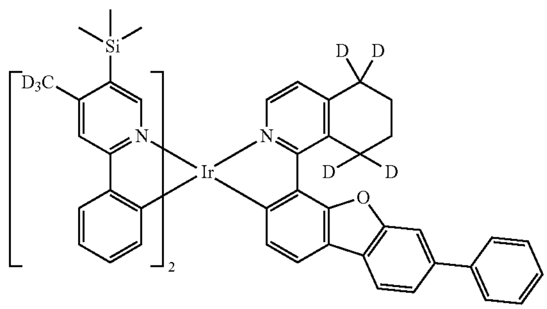
2361
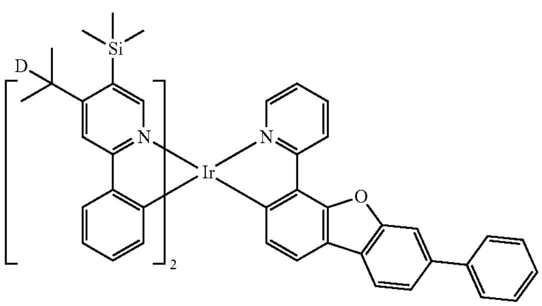
2362
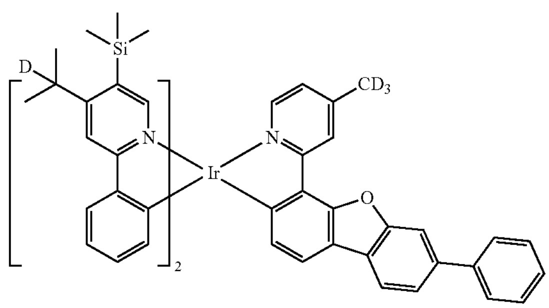
2363
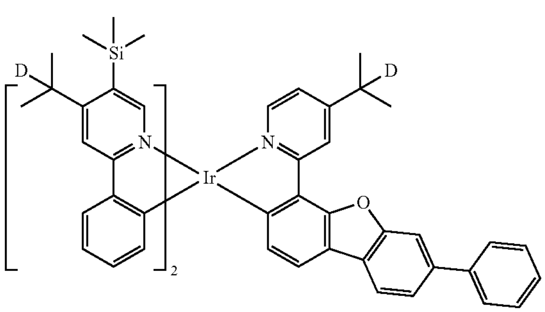
2364
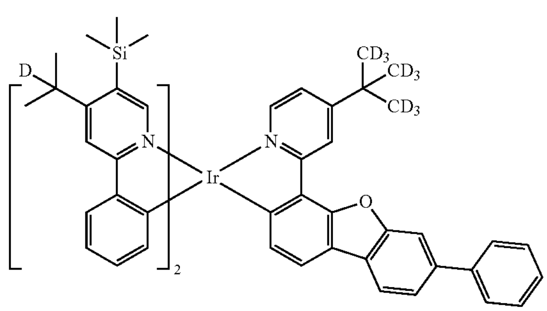

-continued
2365
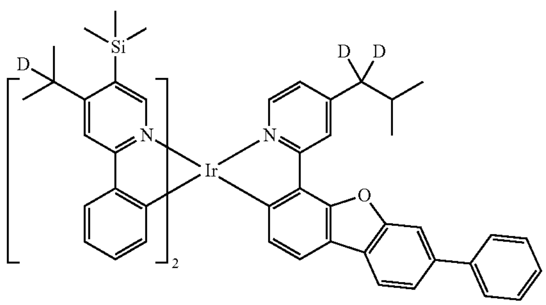
2366
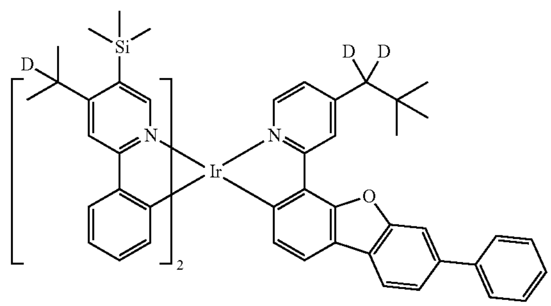
2367
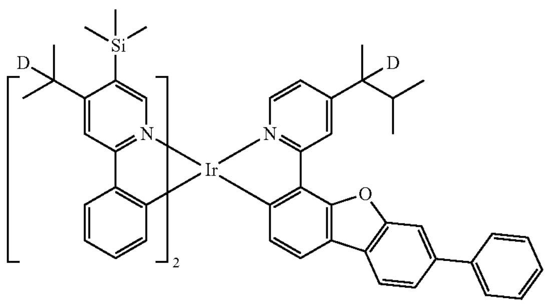
2368
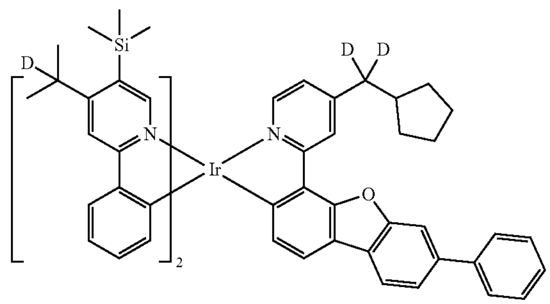
2369
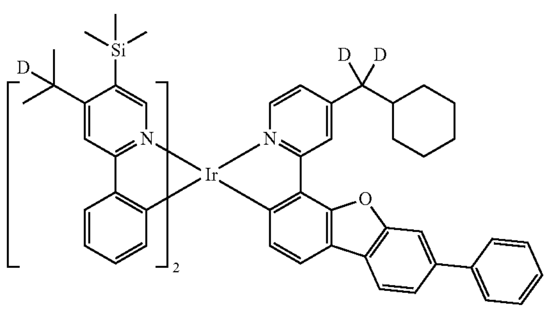
2370
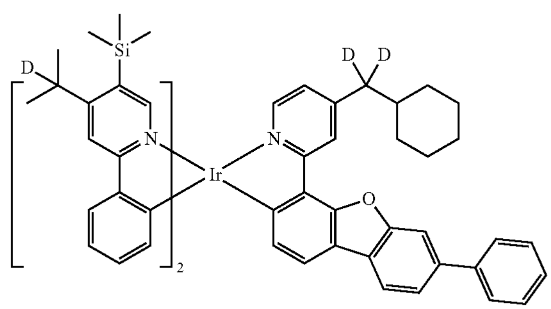
2371
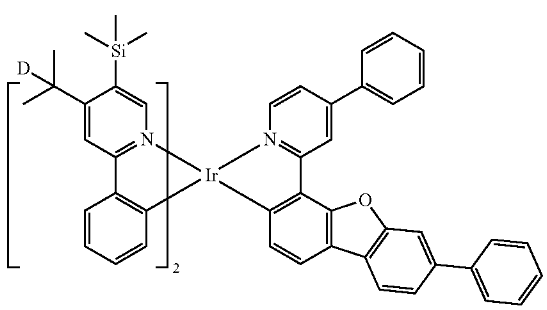
2372
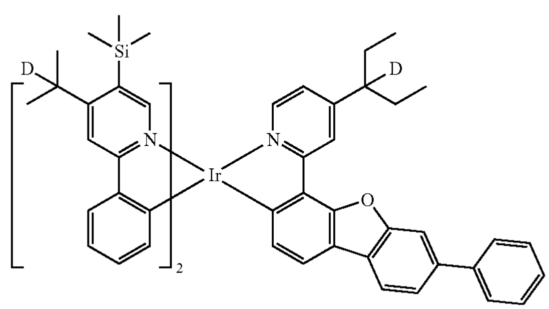
2373
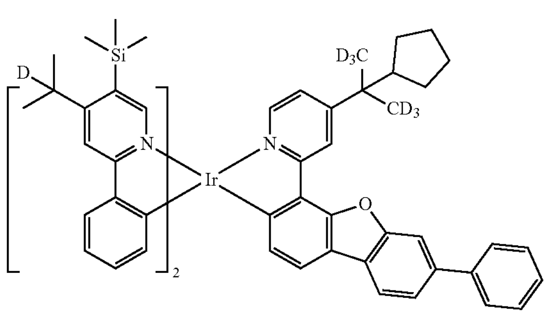
2374
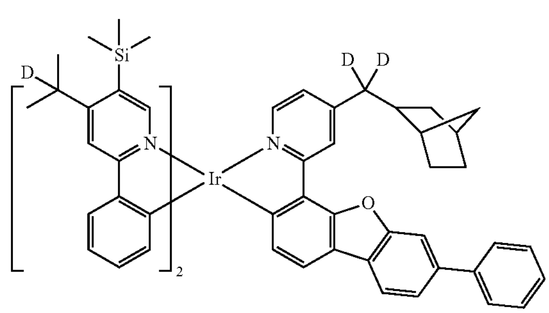

-continued
2375
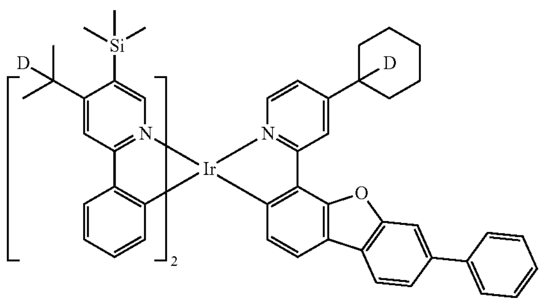
2376
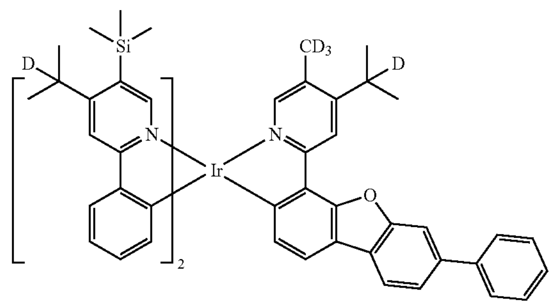
2377
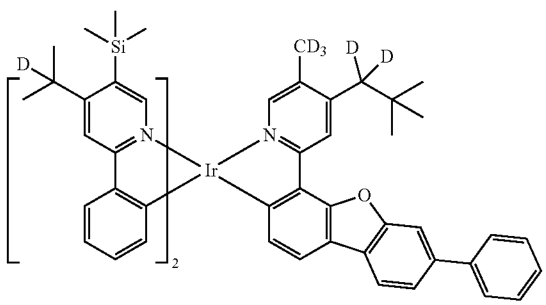
2378
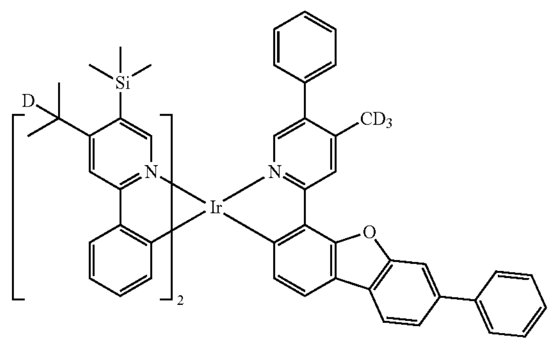
2379
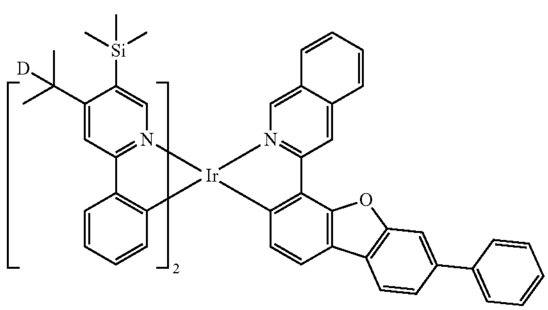
2380
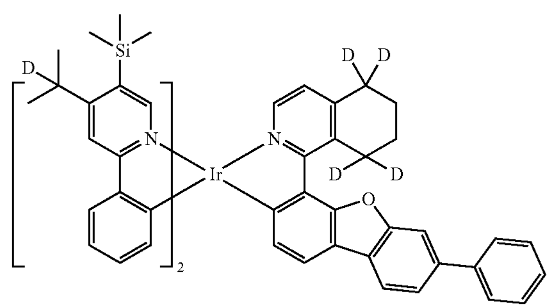
2381
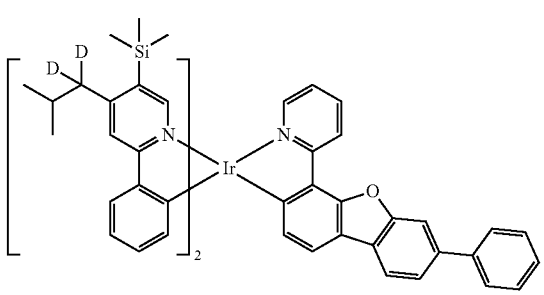
2382
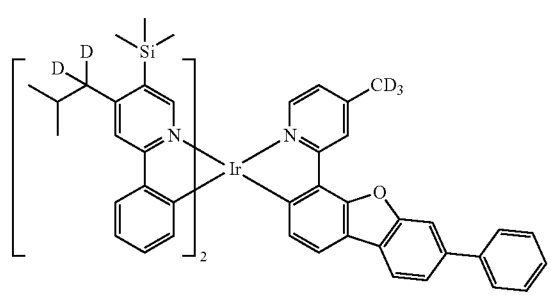
2383
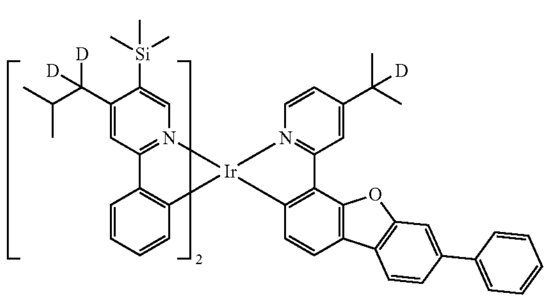
2384
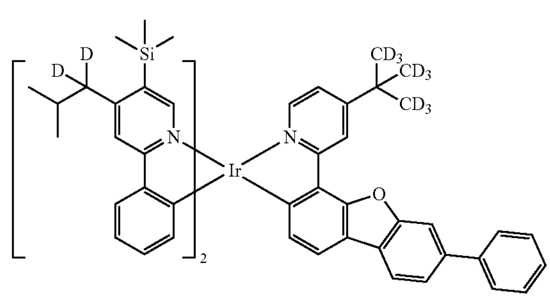

-continued
2385
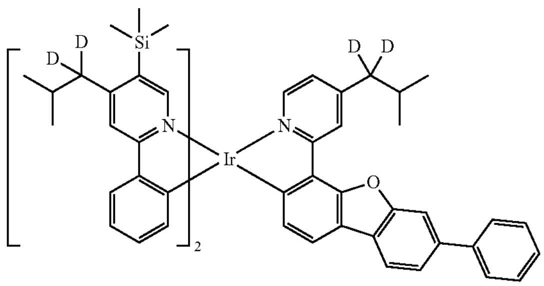
2386
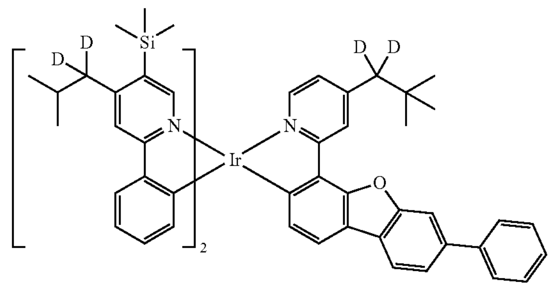
2387
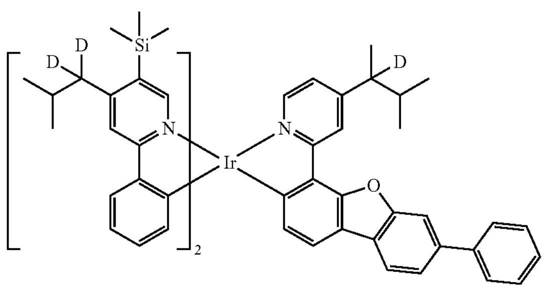
2388
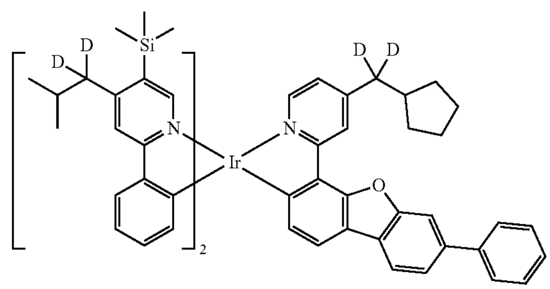
2389
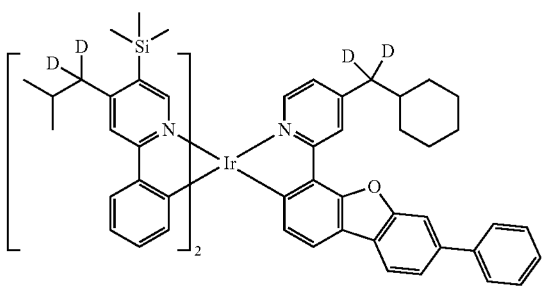
2390
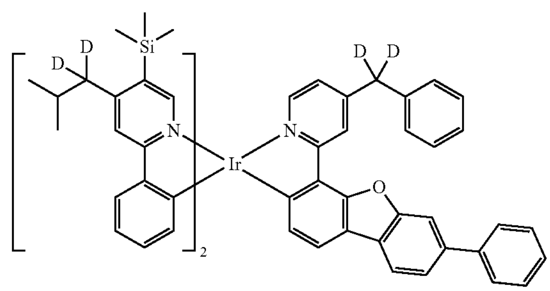
2391
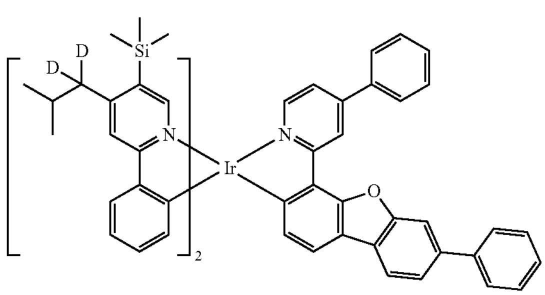
2392
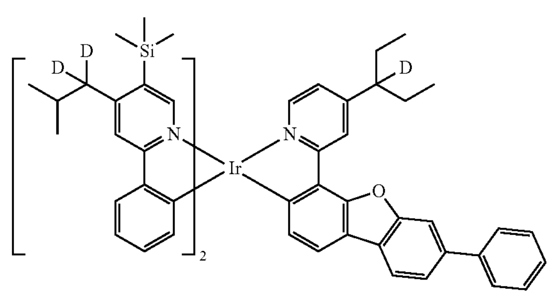
2393
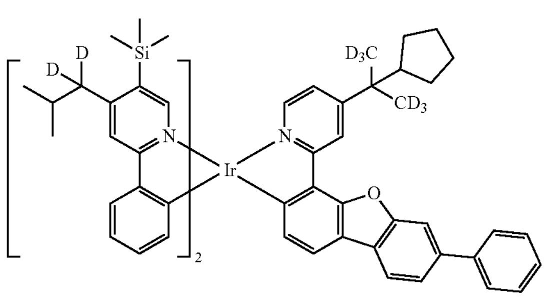
2394
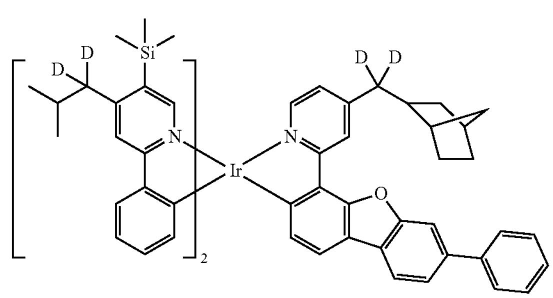

-continued
2395
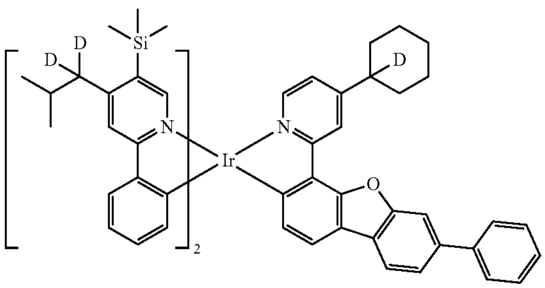
2396
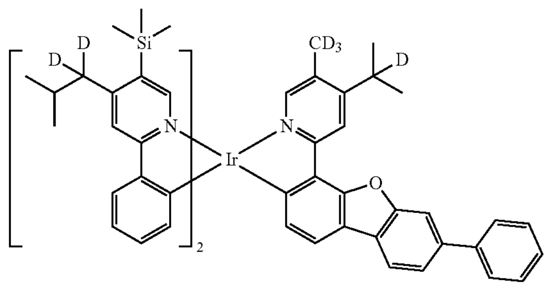
2397
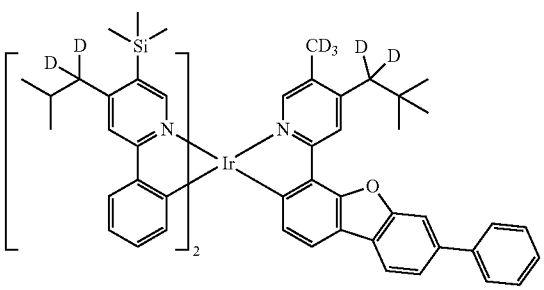
2398
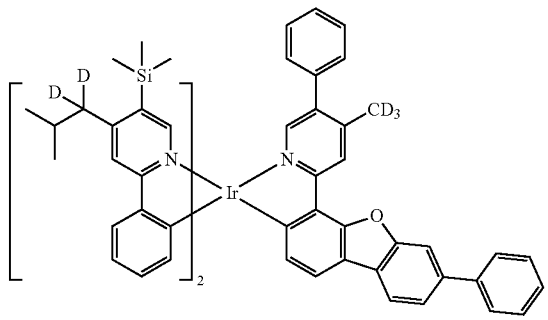
2399
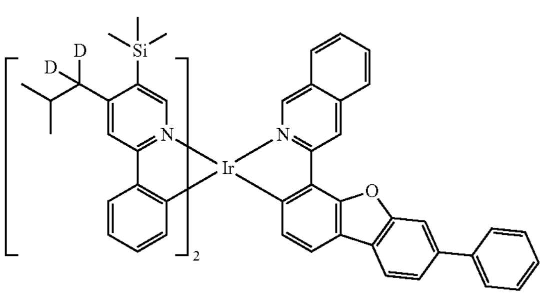
2400
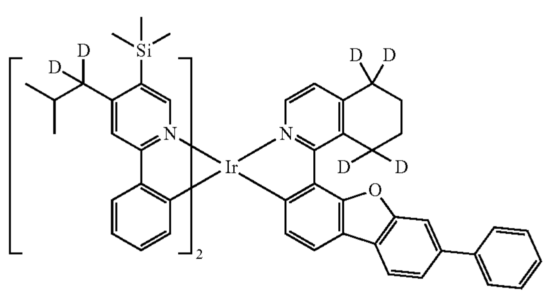
2401
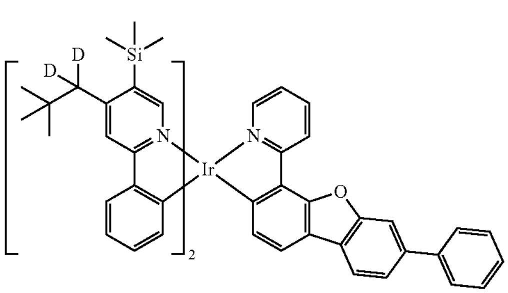
2402
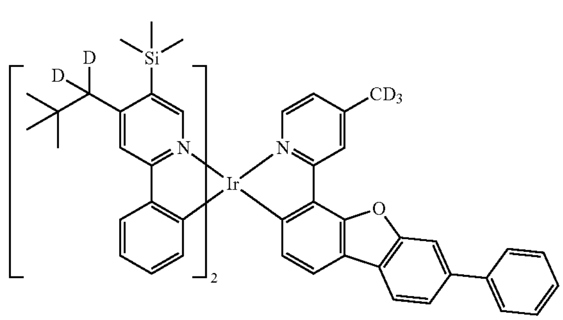

-continued
2403
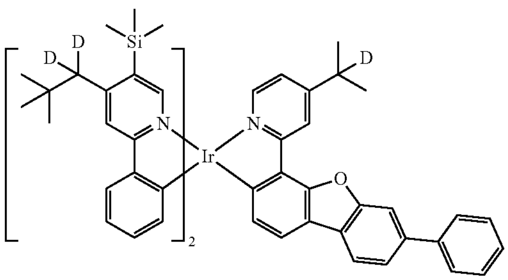
2404
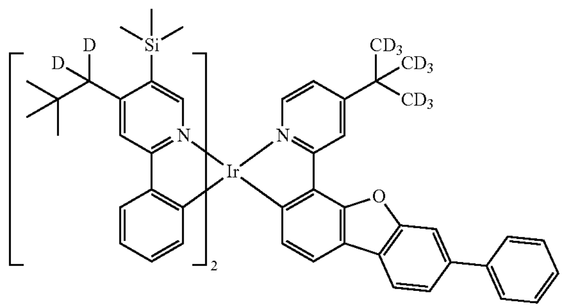
2405
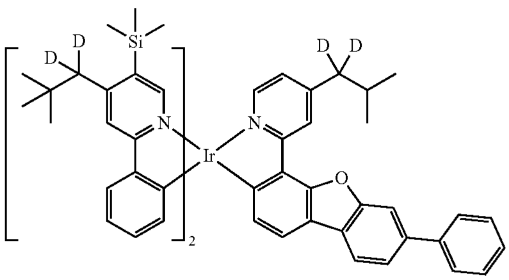
2406
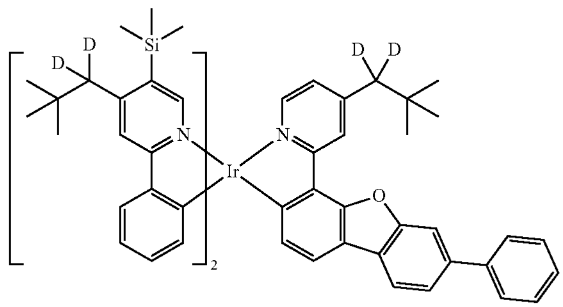
2407
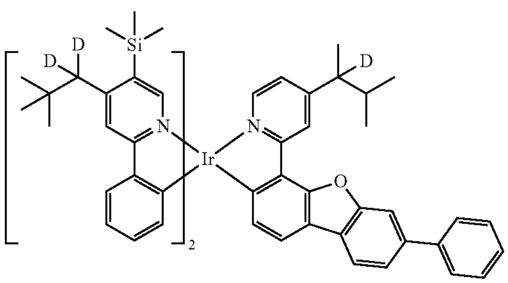
2408
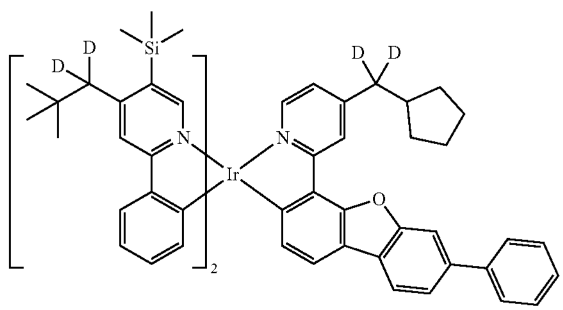
2409
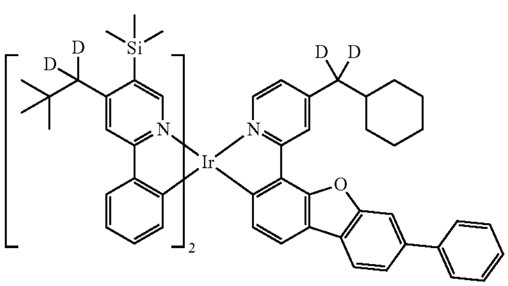
2410
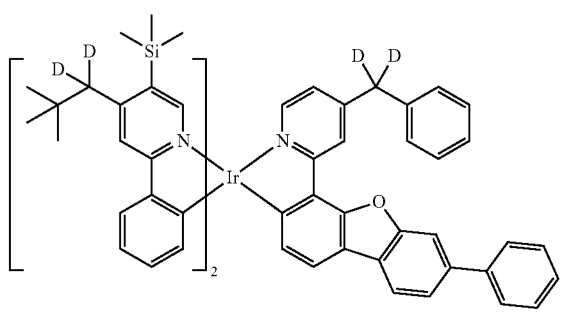
2411
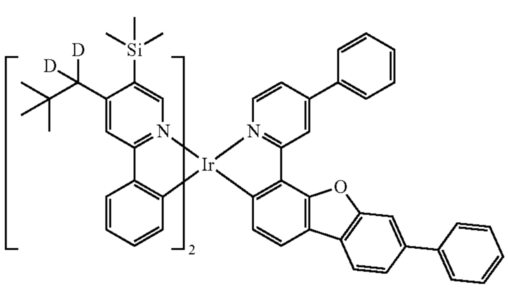
2412
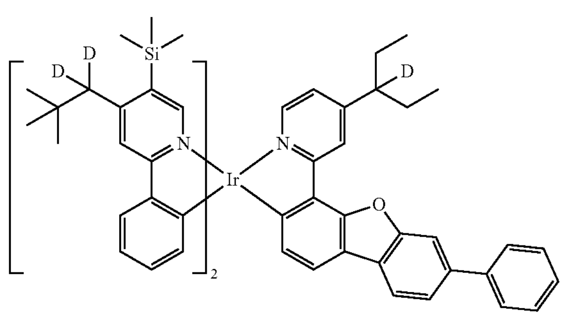

-continued
2413
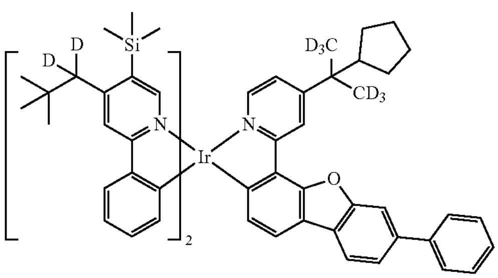
2414
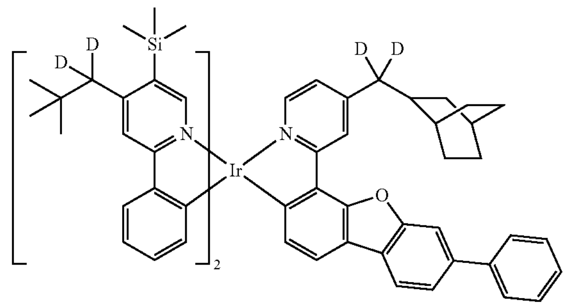
2415
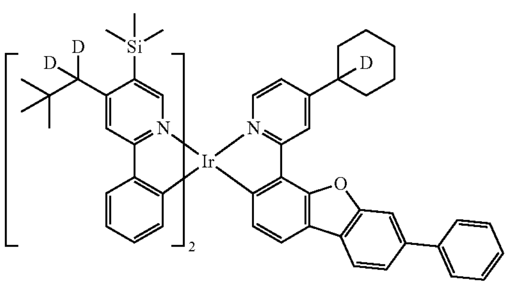
2416
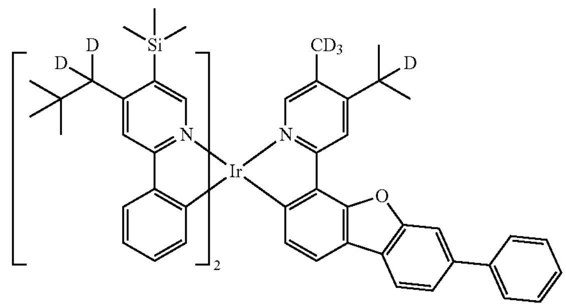
2417
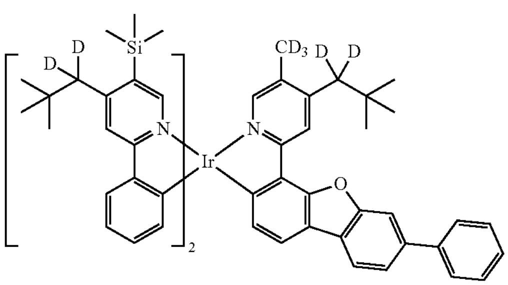
2418
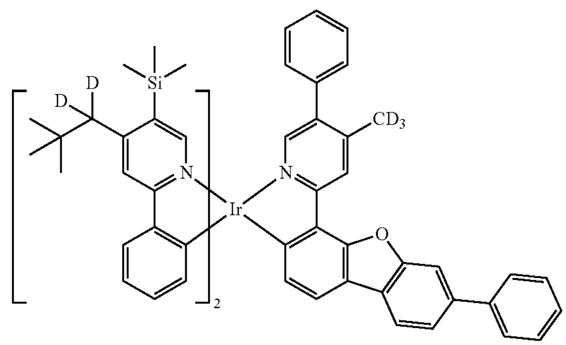
2419
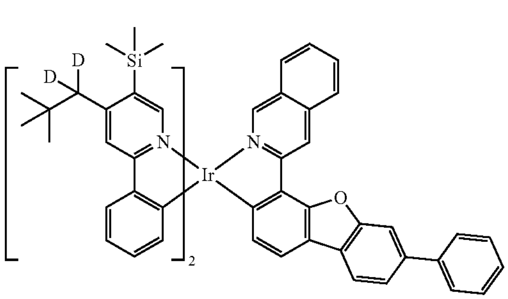
2420
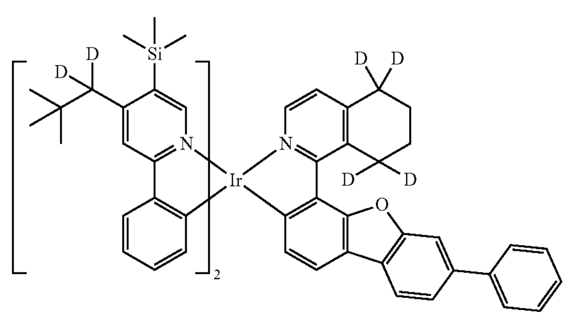

-continued
2421
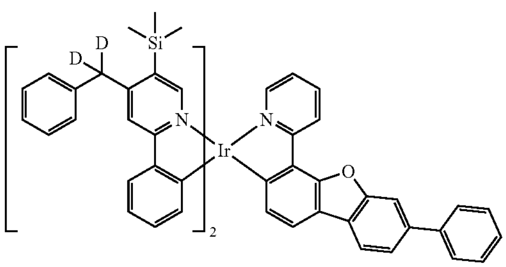
2422
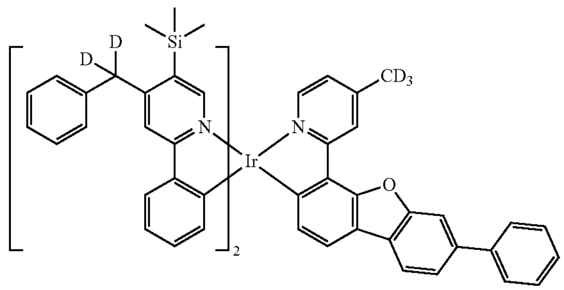
2423
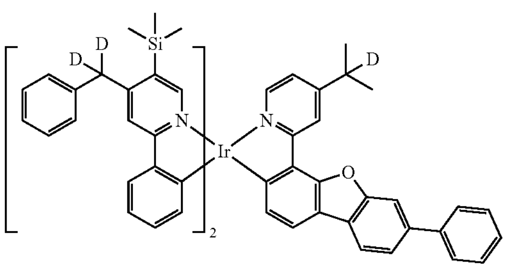
2424
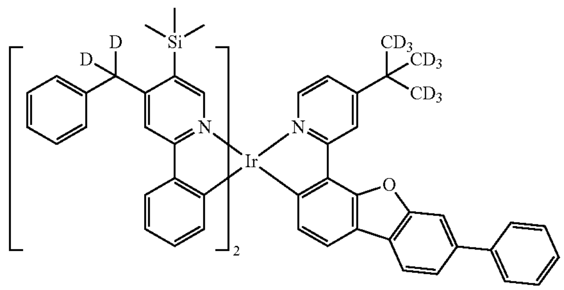
2425
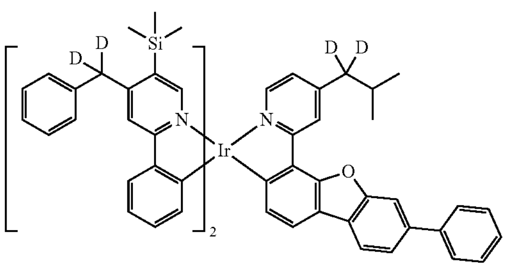
2426
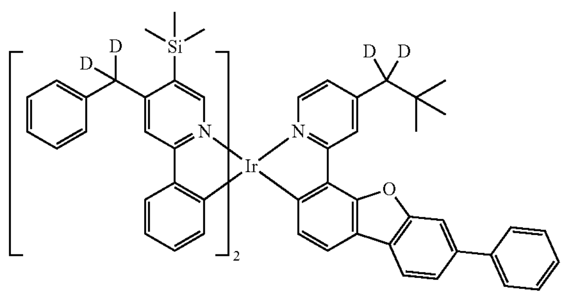
2427
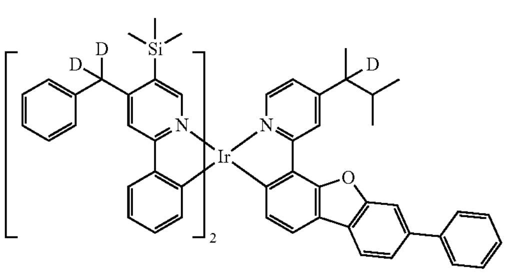
2428
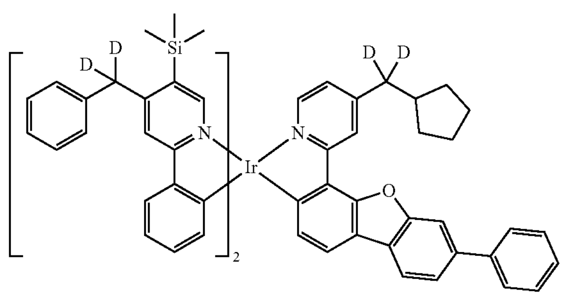
2429
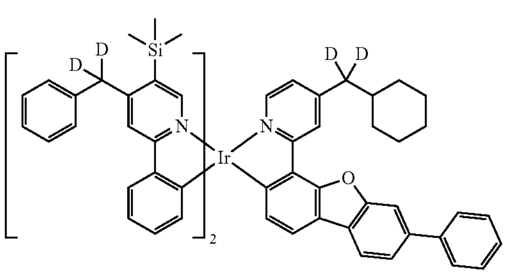
2430
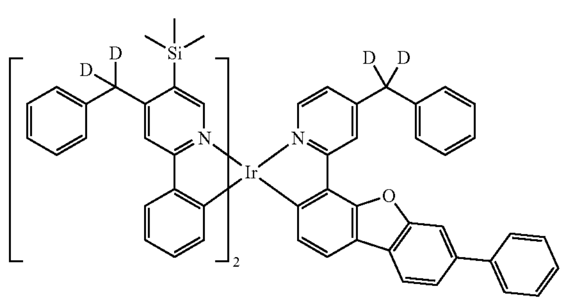

-continued
2431
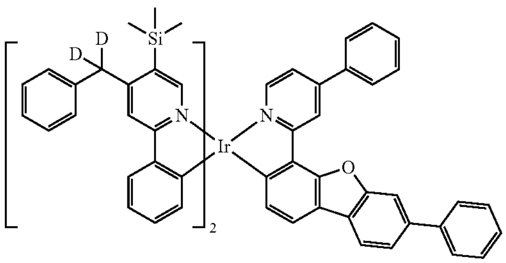
2432
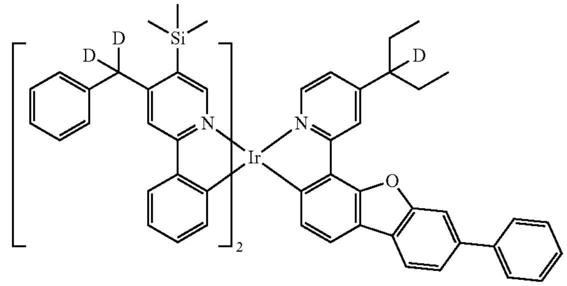
2433
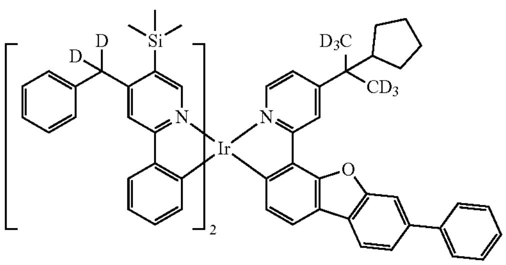
2434
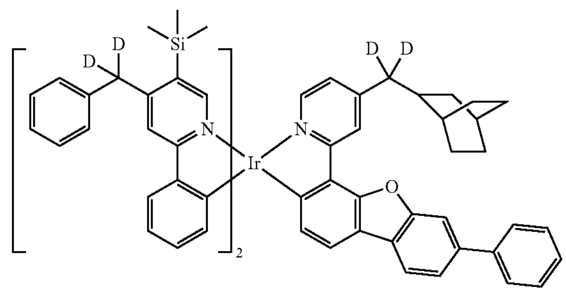
2435
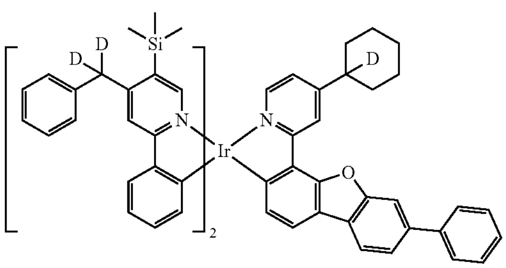
2436
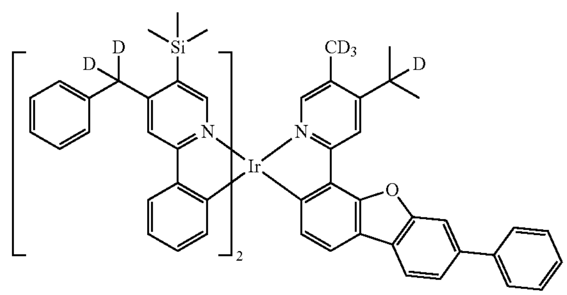
2437
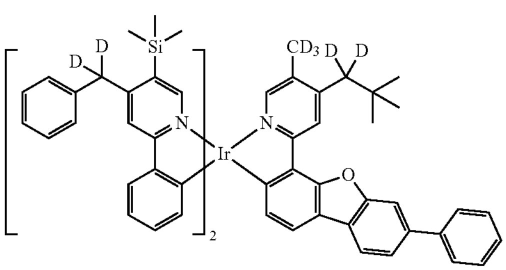
2438
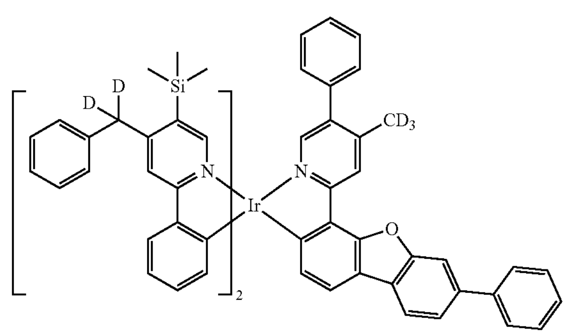
2439
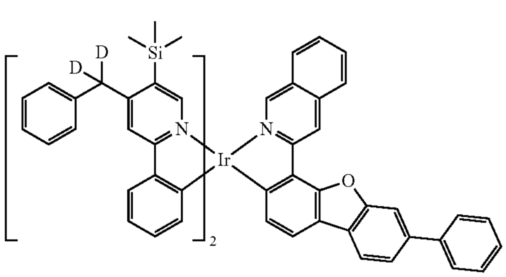
2440
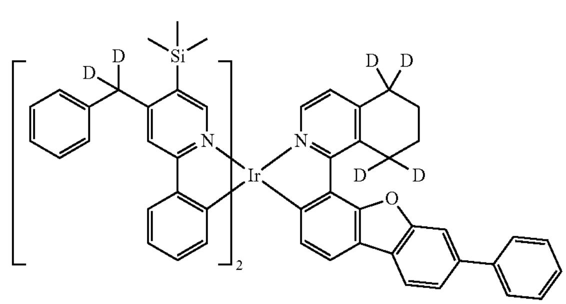

-continued
2441
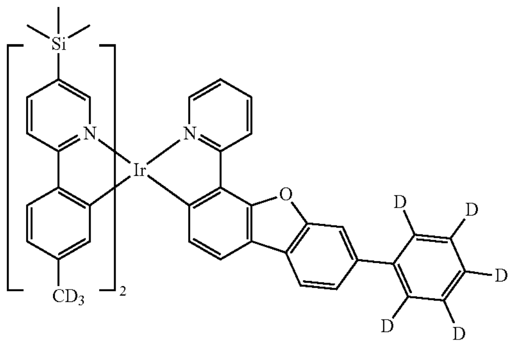
2442
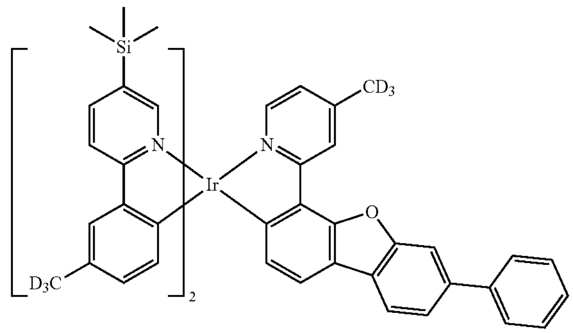
2443
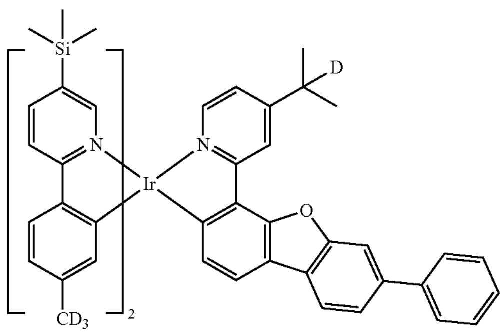
2444
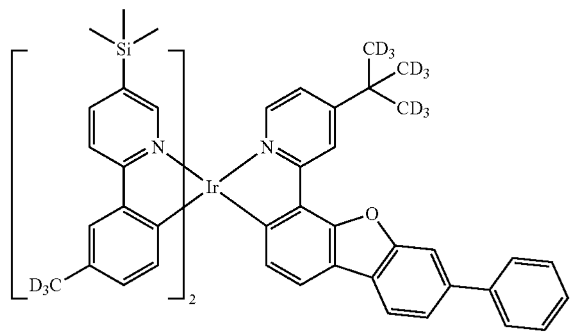
2445
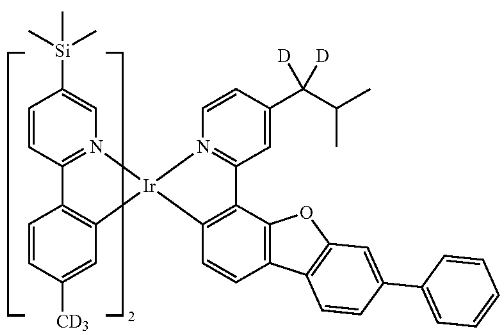
2446
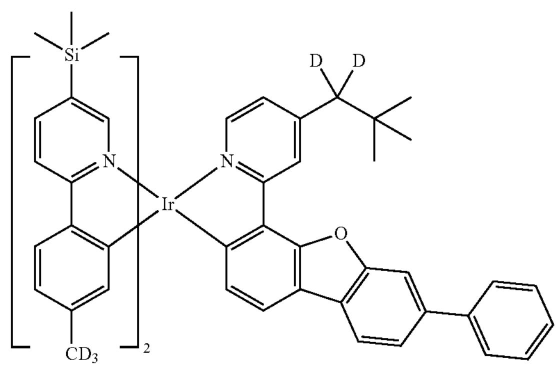
2447
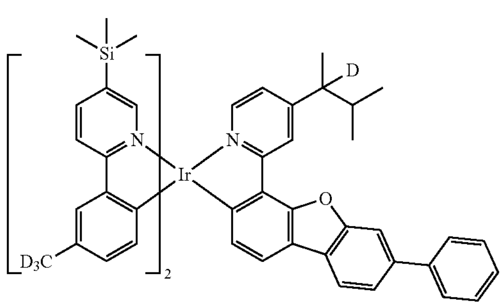
2448
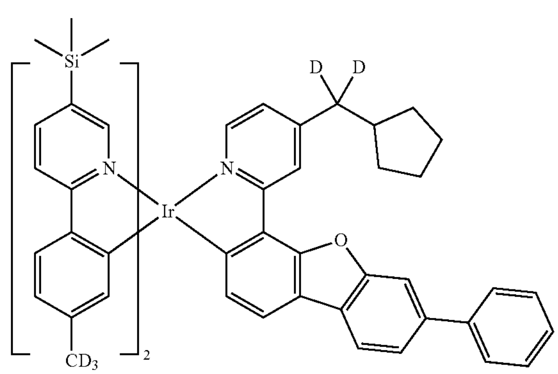

-continued
2449
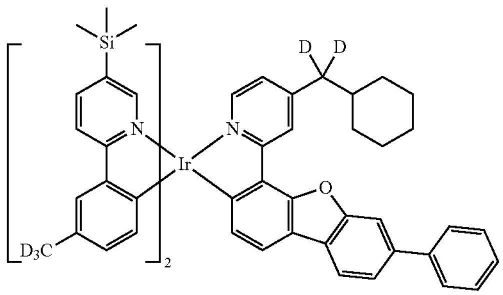
2450
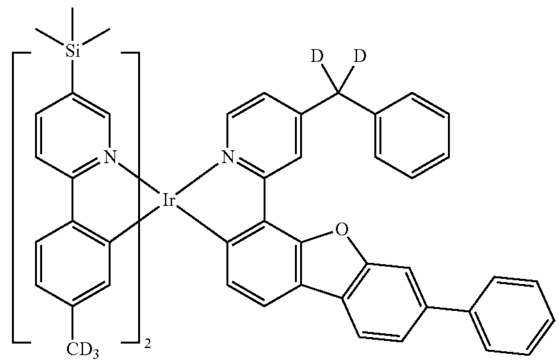
2451
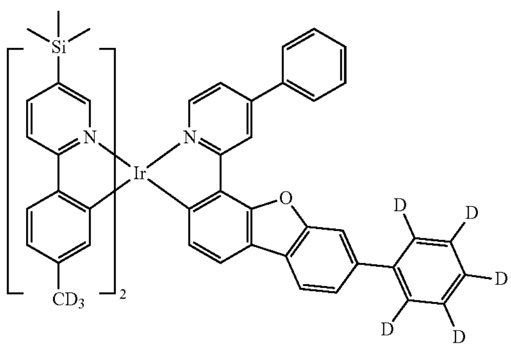
2452
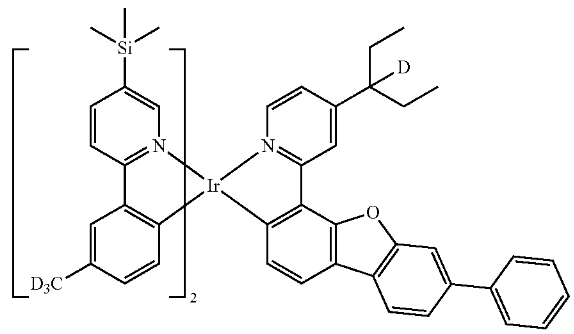
2453
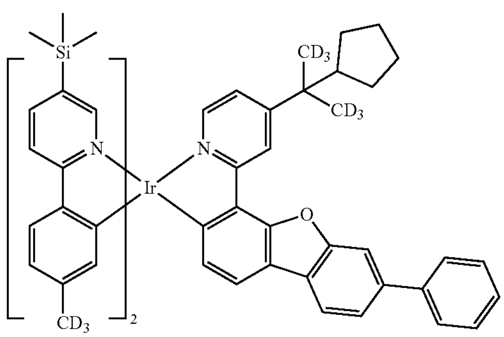
2454
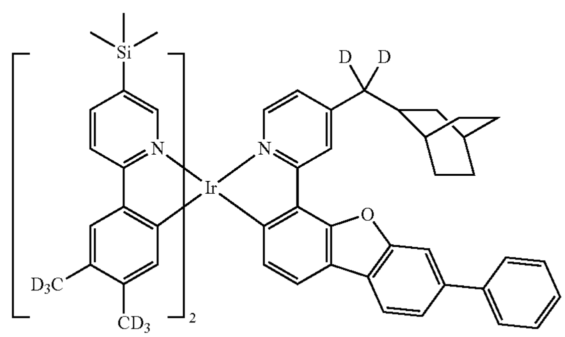
2455
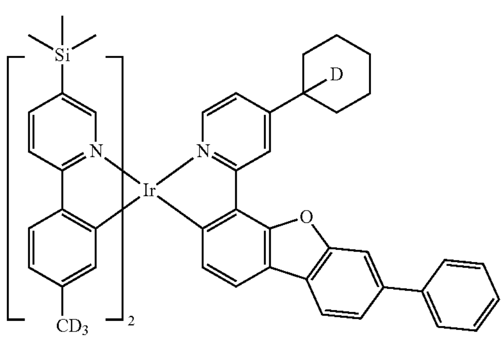
2456
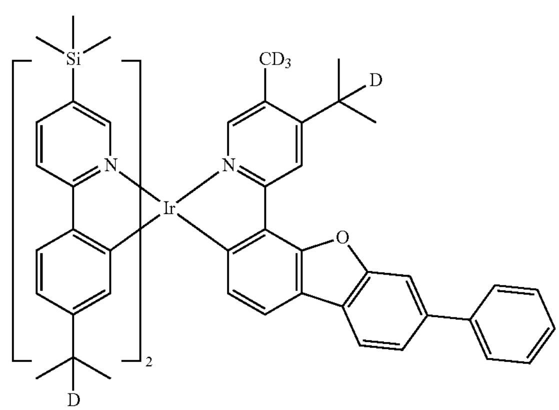

-continued
2457
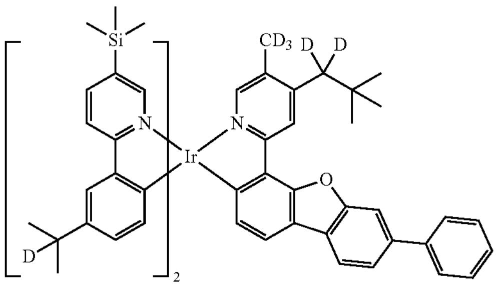
2458
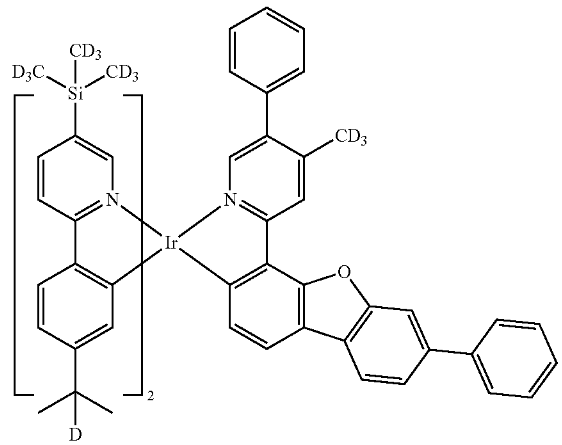
2459
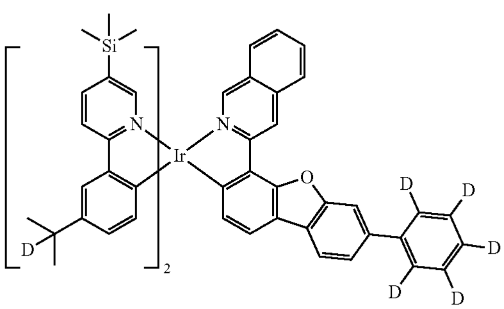
2460
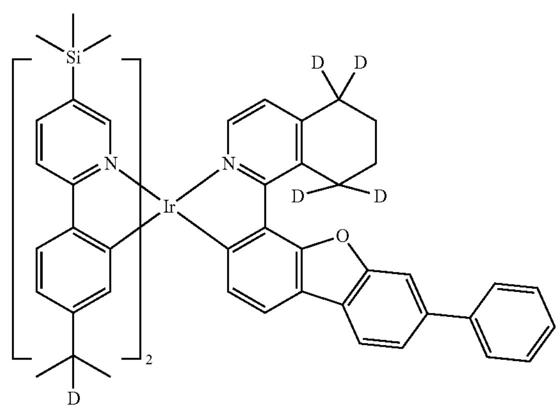
2461
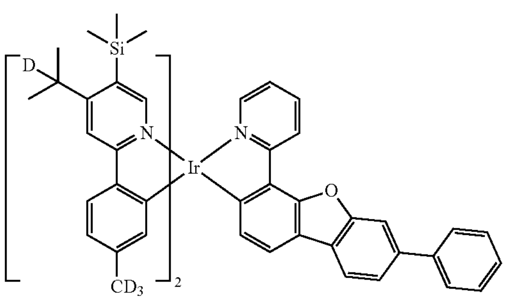
2462
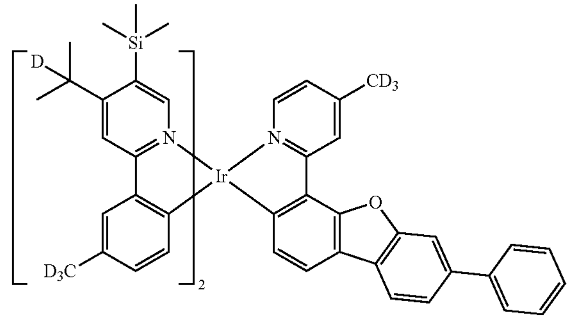
2463
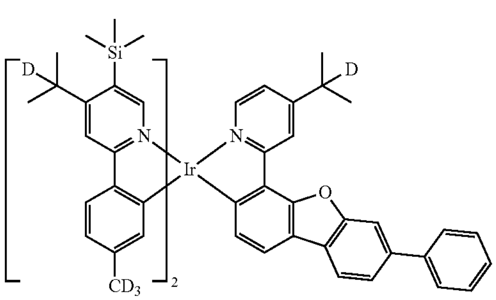
2464
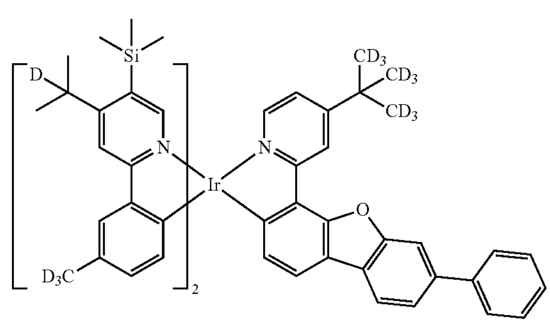

-continued
2465
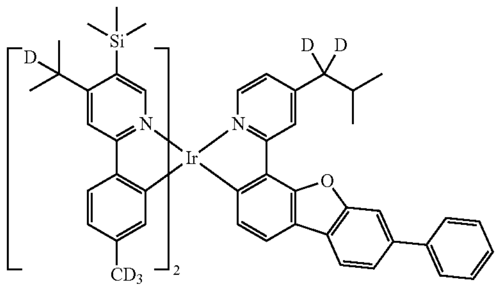
2466
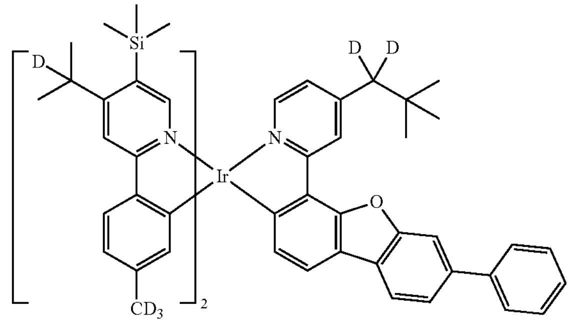
2467
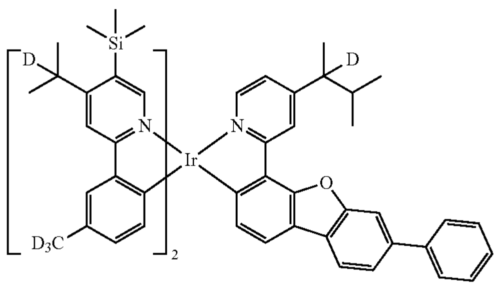
2468
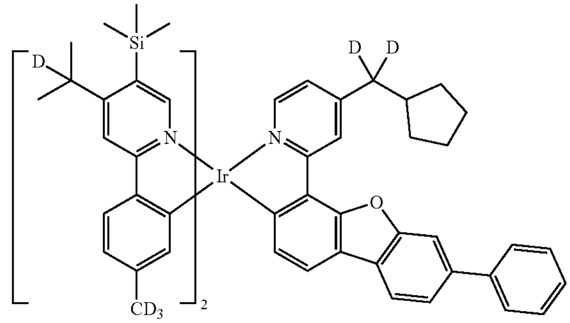
2469
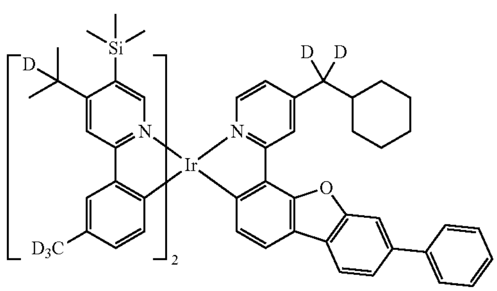
2470
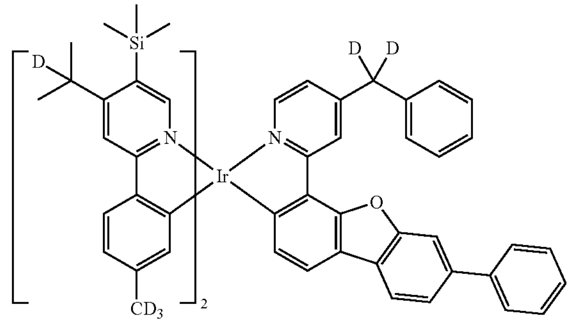
2471
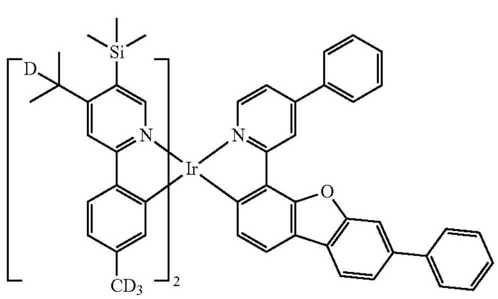
2472
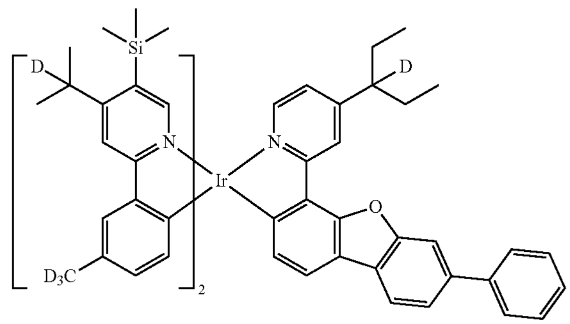

-continued
2473
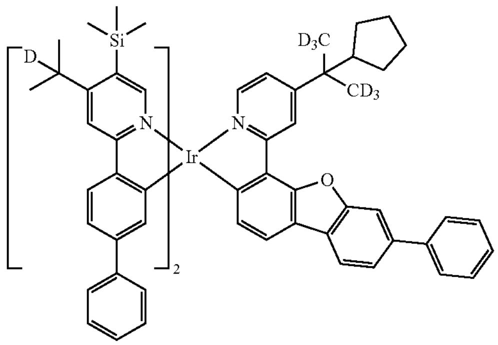
2474
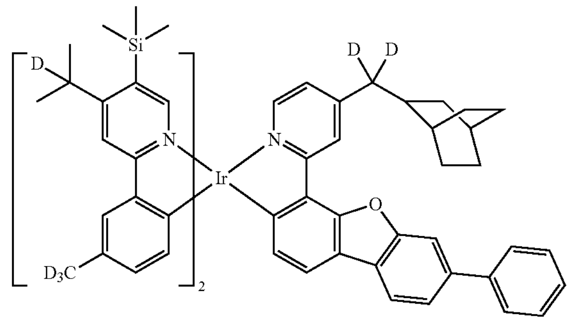
2475
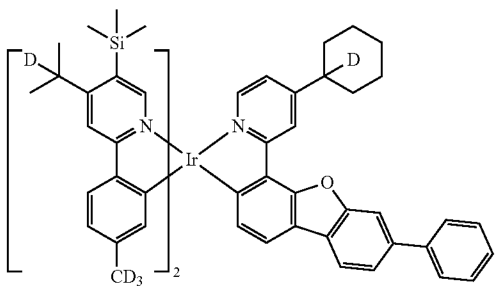
2476
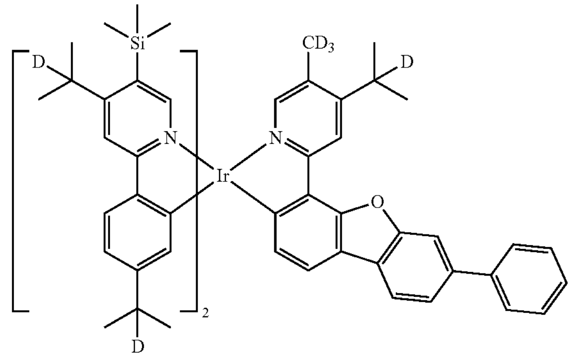
2477
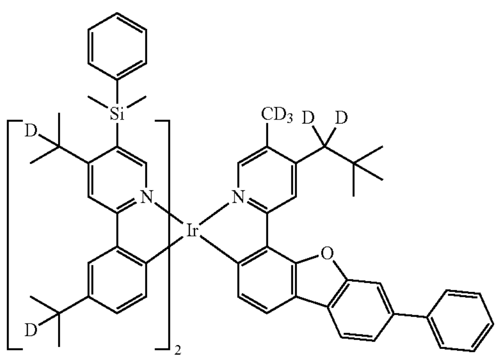
2478
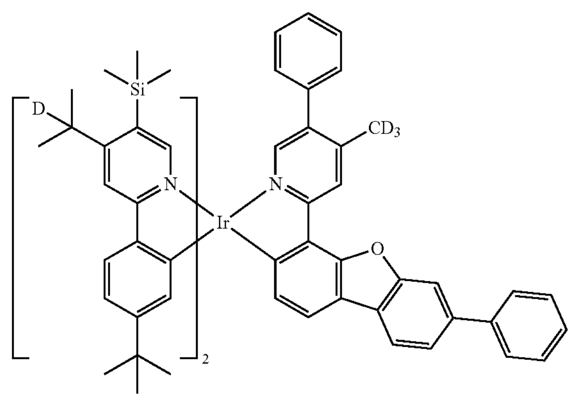
2479
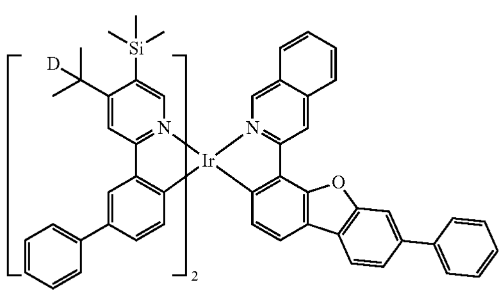
2480
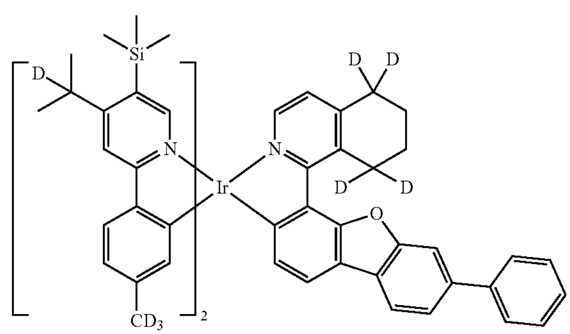

-continued
2481
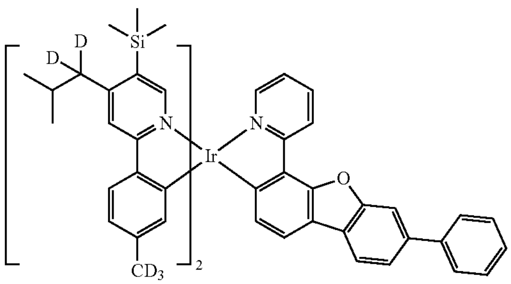
2482
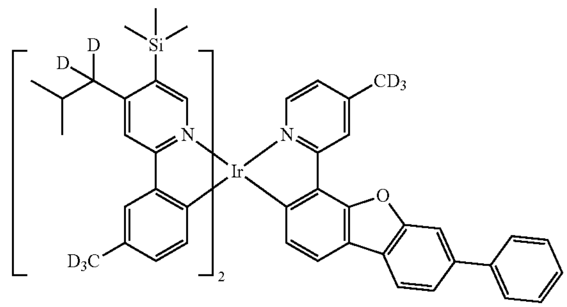
2483
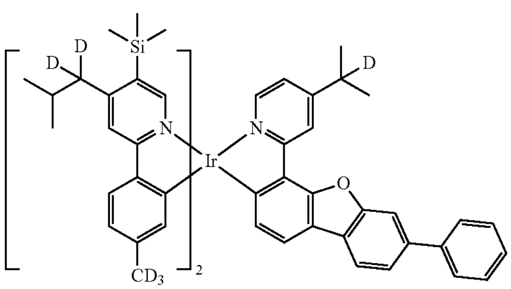
2484
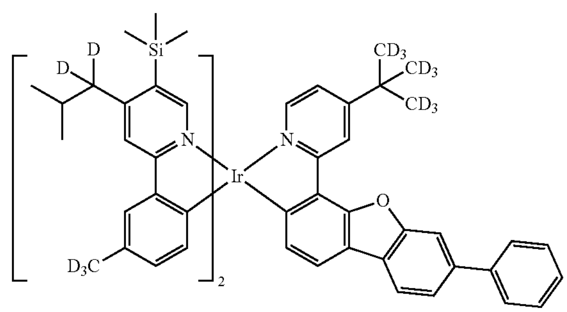
2485
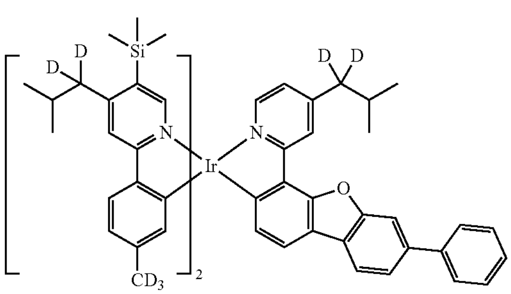
2486
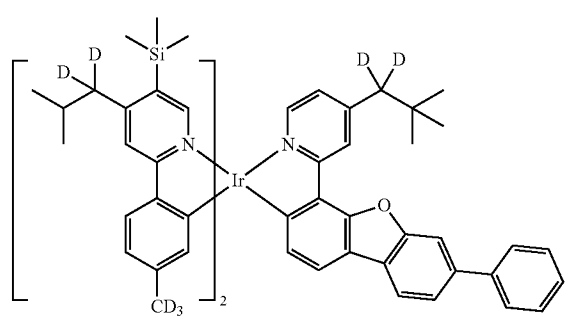
2487
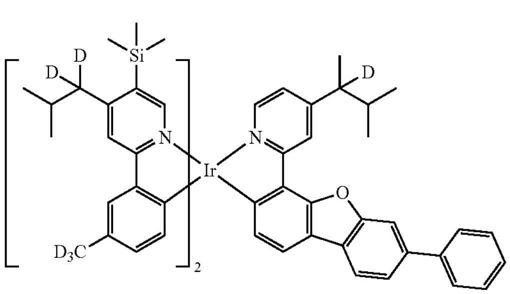
2488
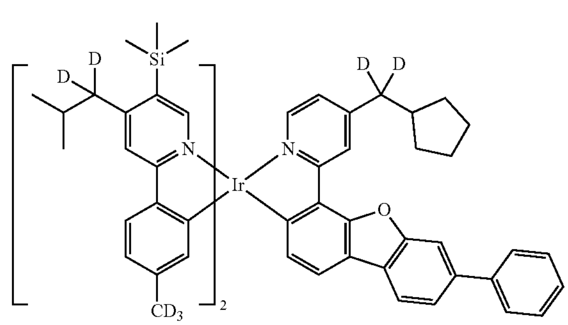

-continued
2489
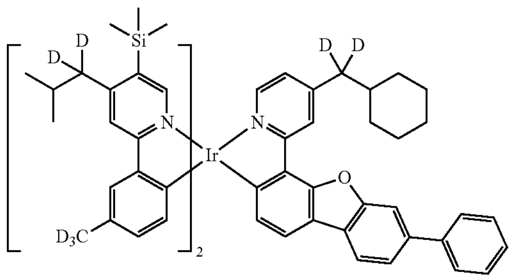
2490
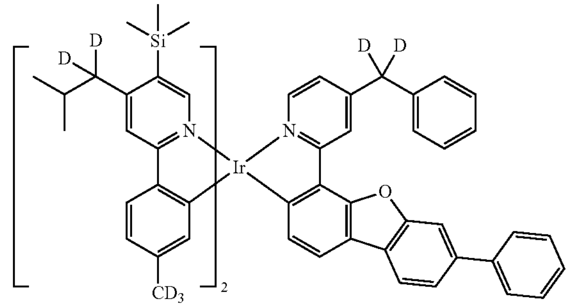
2491
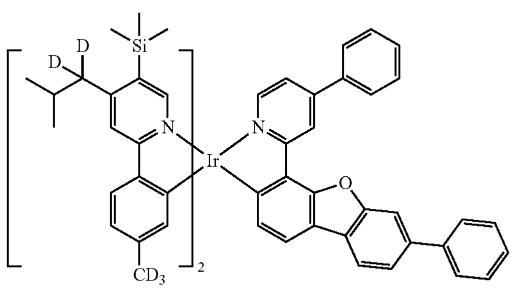
2492
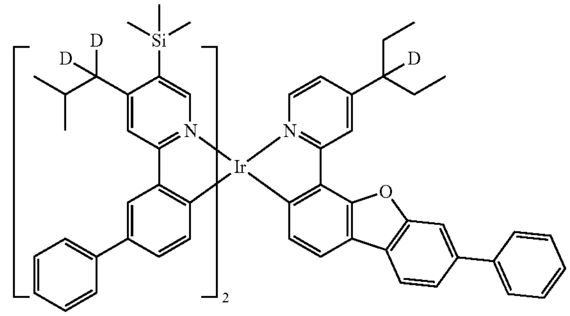
2493
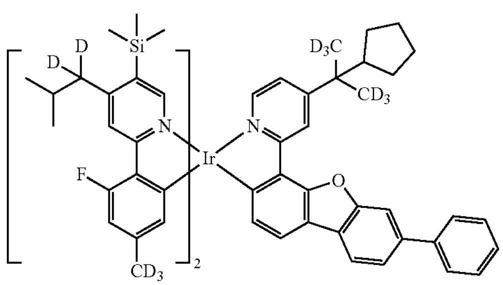
2494
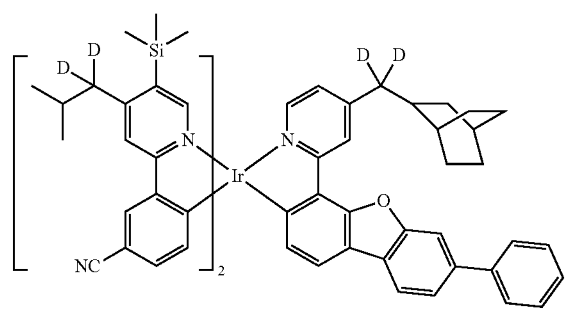
2495
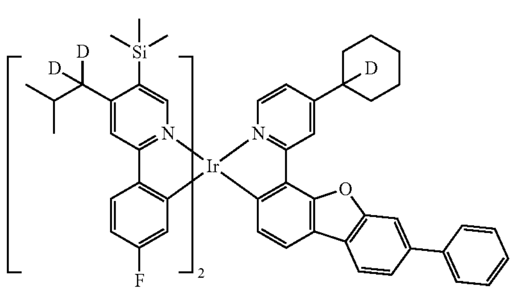
2496
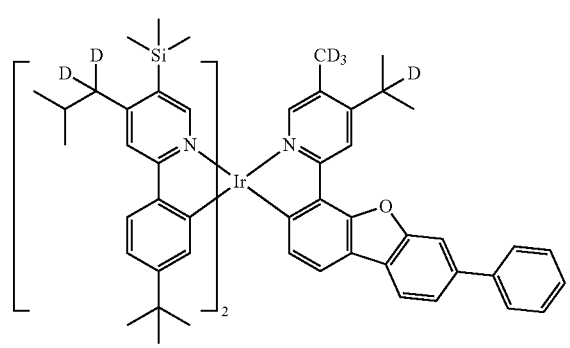

-continued
2497
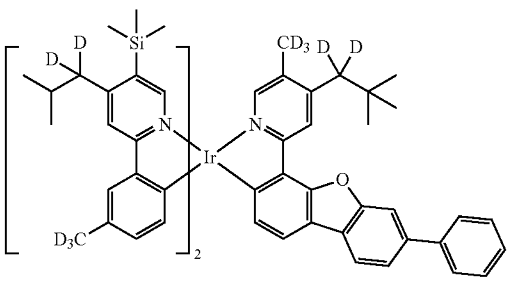
2498
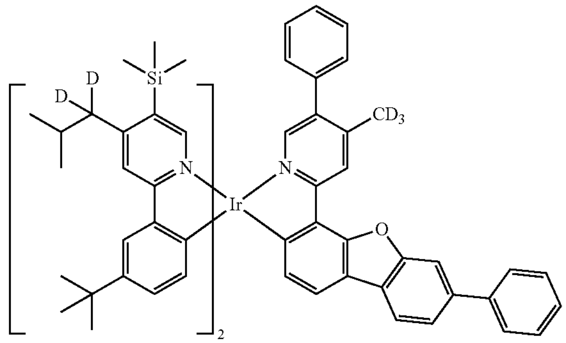
2499
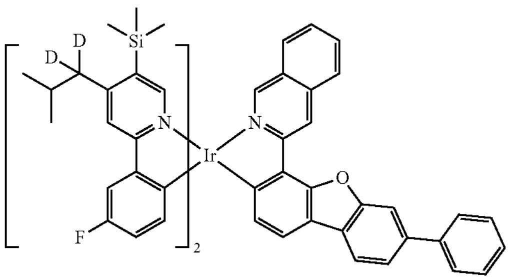
2500
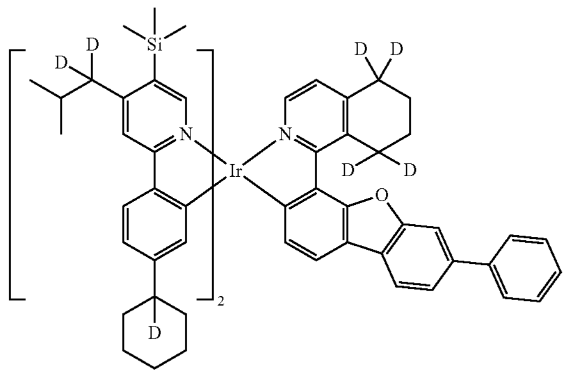
2501
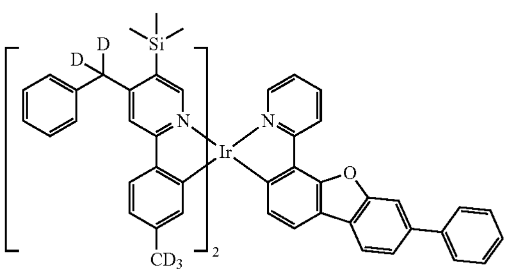
2502
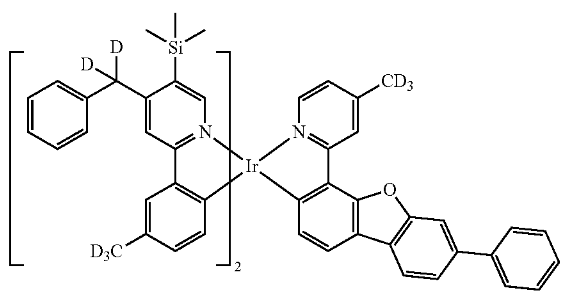
2503
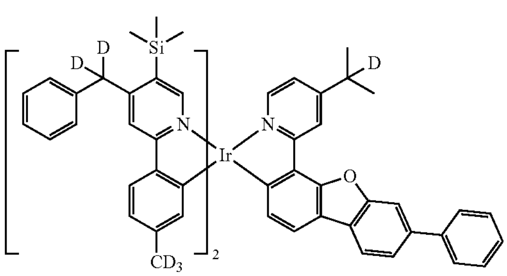
2504
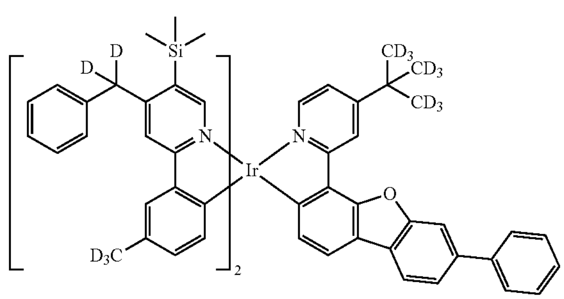

-continued
2505
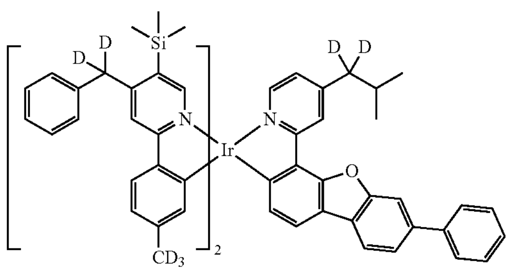
2506
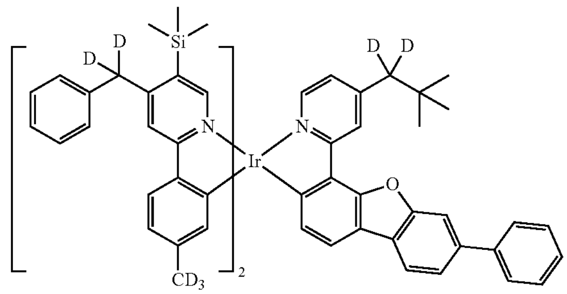
2507
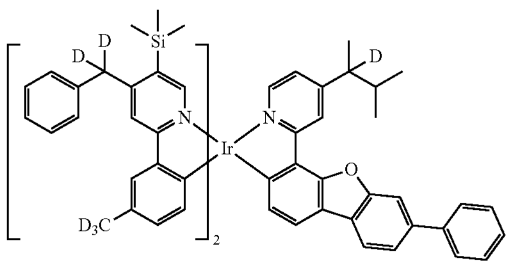
2508
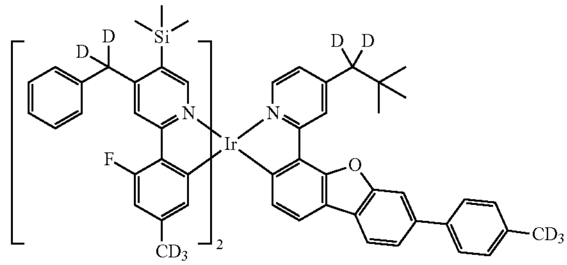
2509
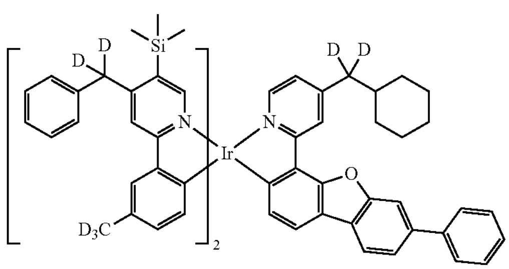
2510
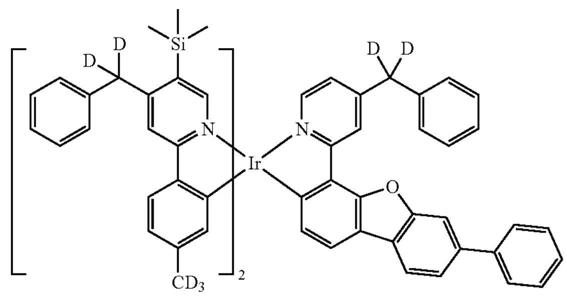
2511
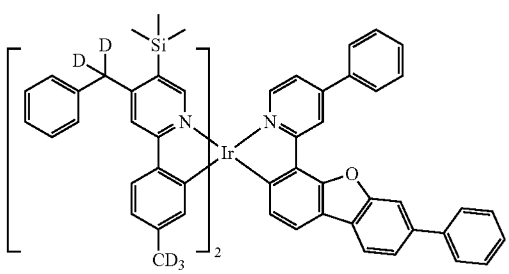
2512
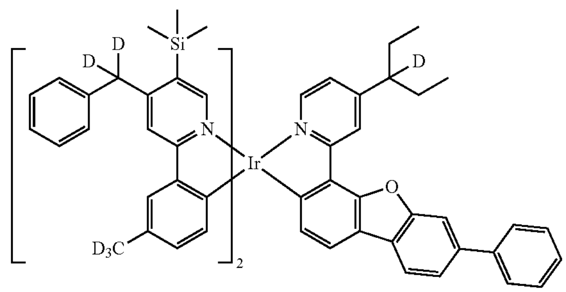
2513
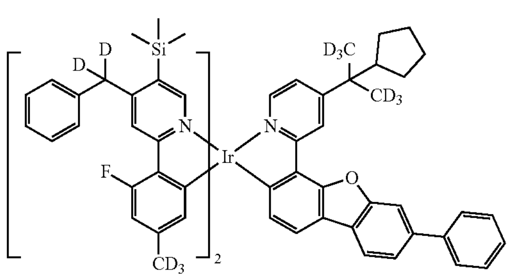
2514
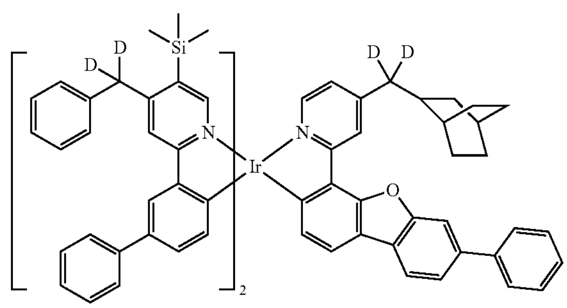

-continued
2515
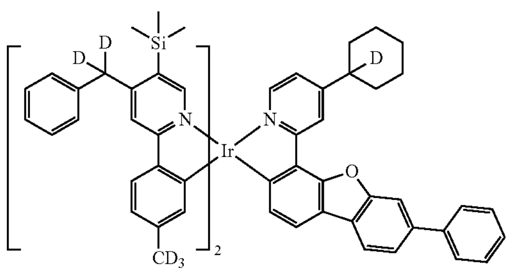
2516
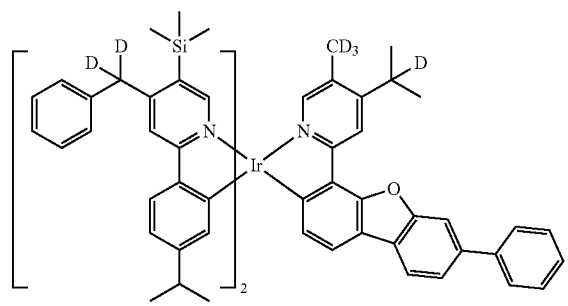
2517
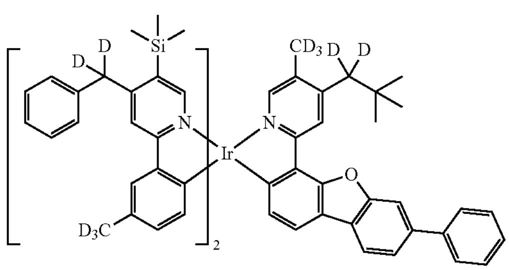
2518
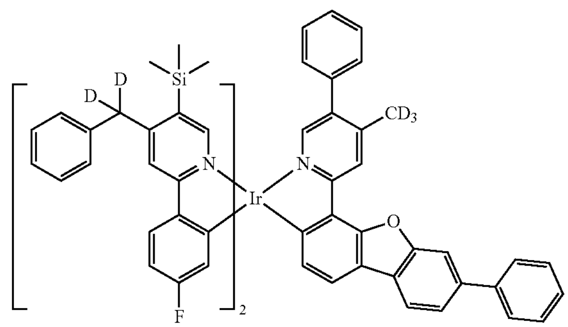
2519
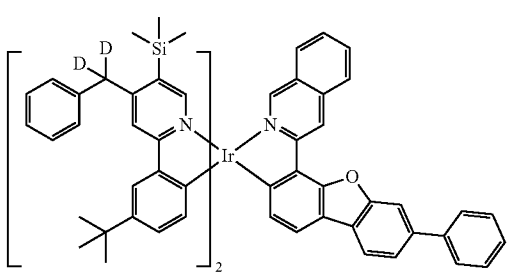
2520
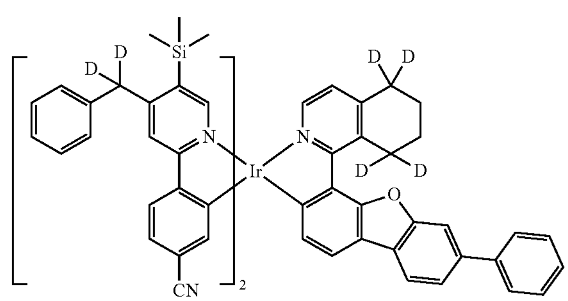
2521
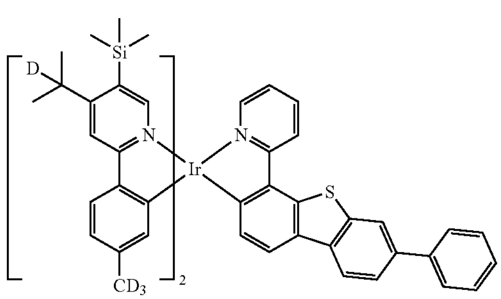
2522
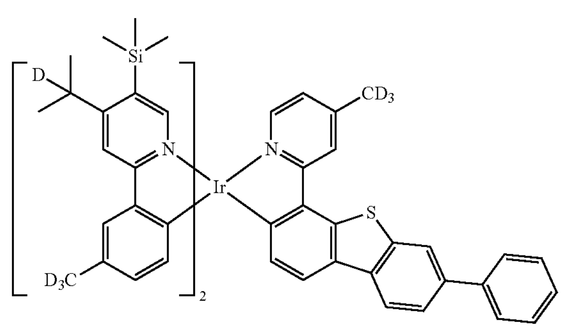

-continued
2523
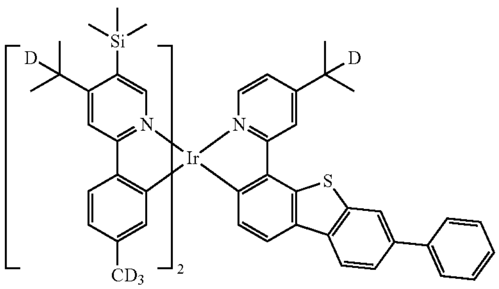
2524
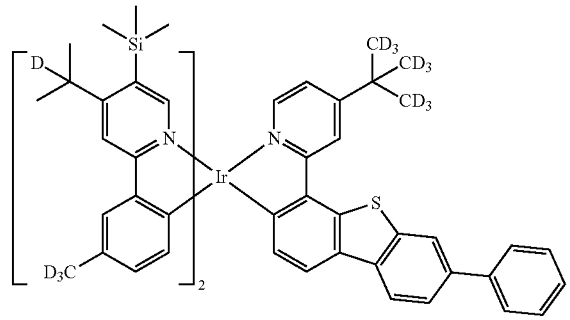
2525
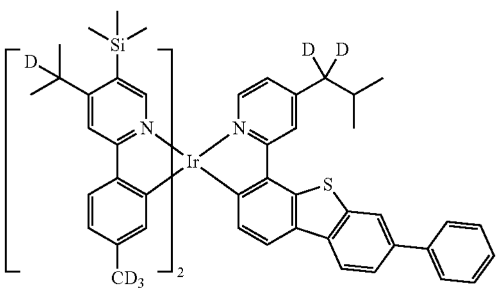
2526
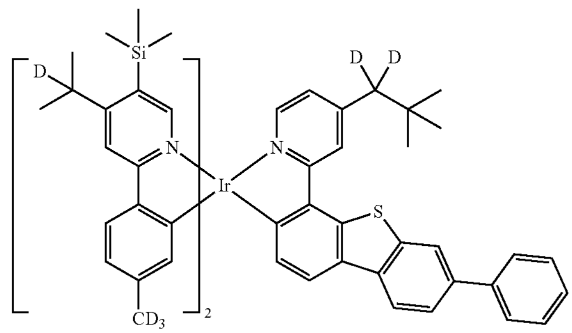
2527
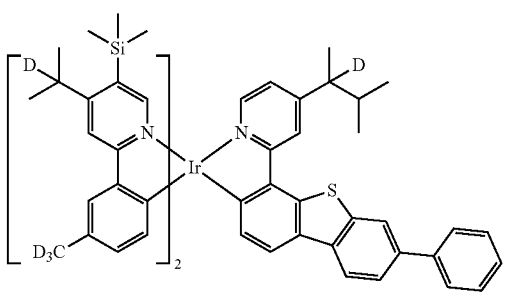
2528
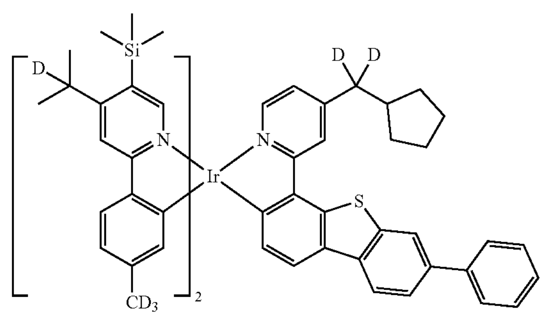
2529
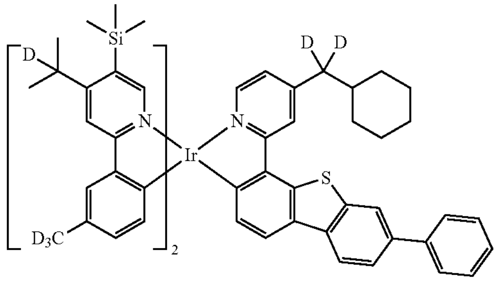
2530
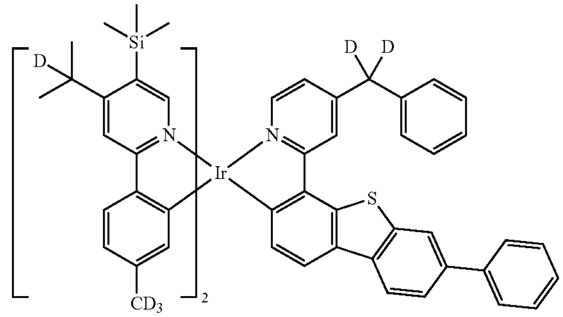

-continued
2531
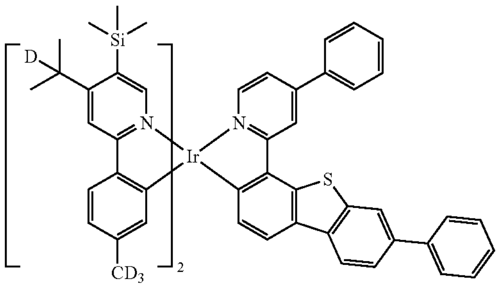
2532
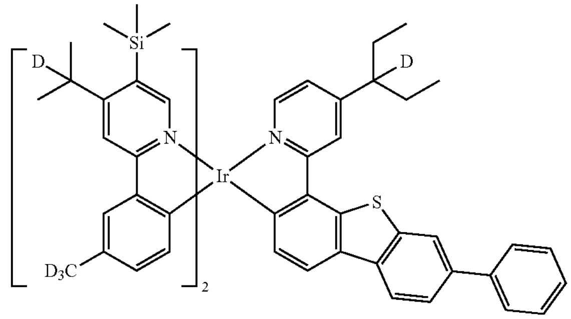
2533
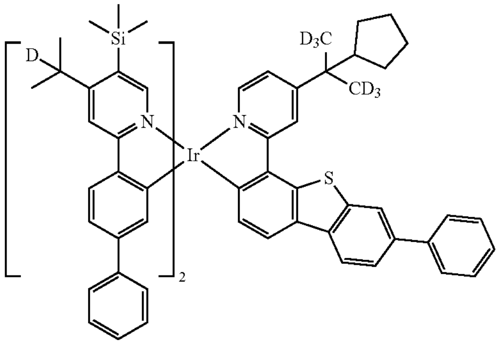
2534
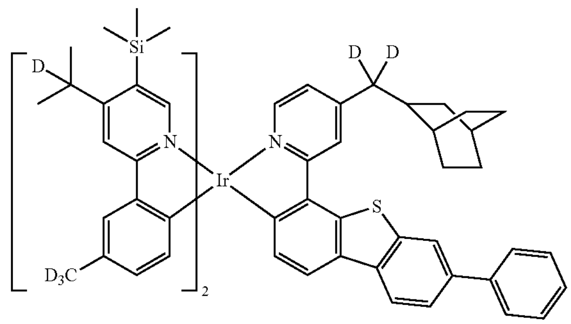
2535
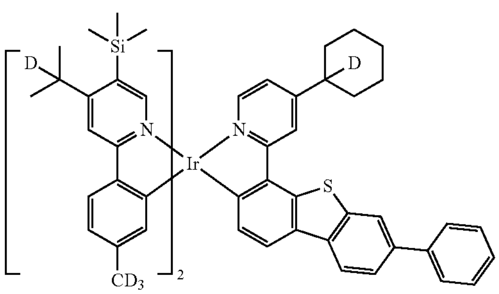
2536
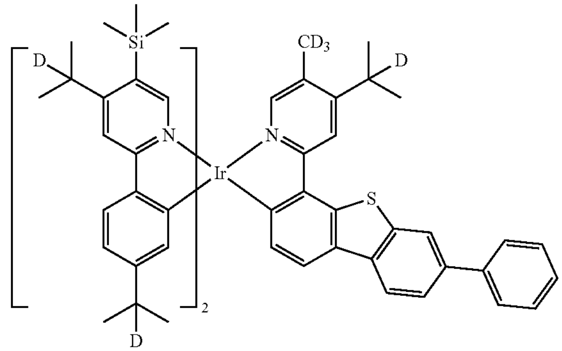
2537
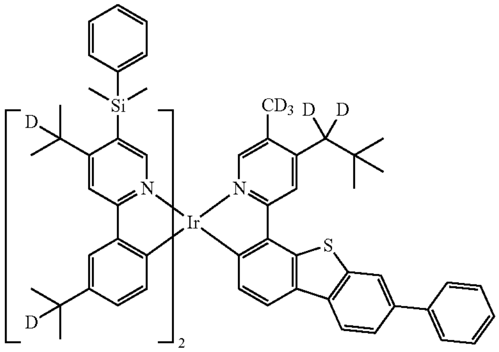
2538
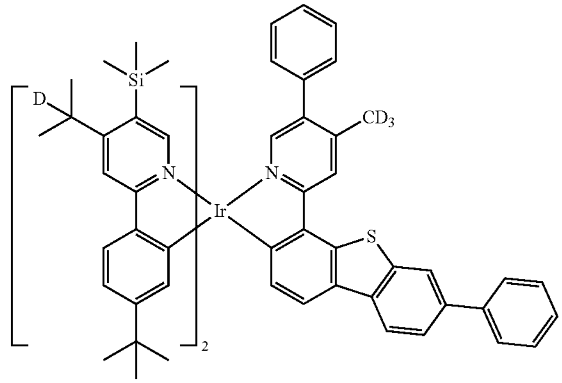

-continued
2539
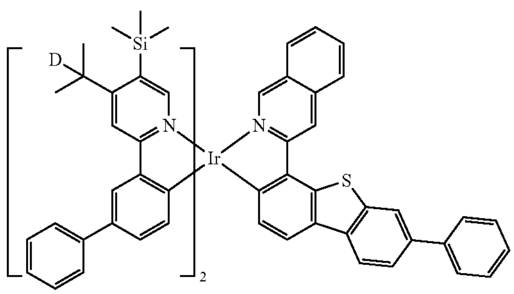
2540
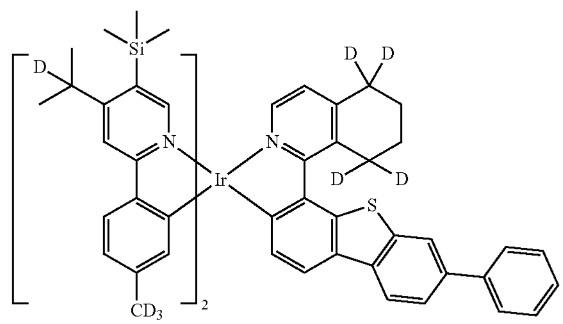
2541
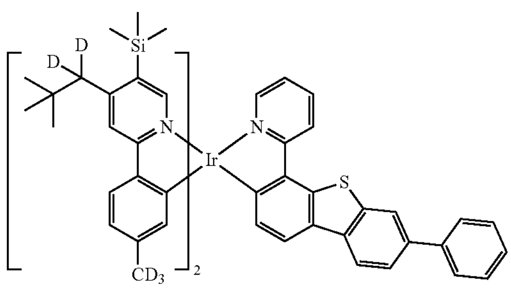
2542
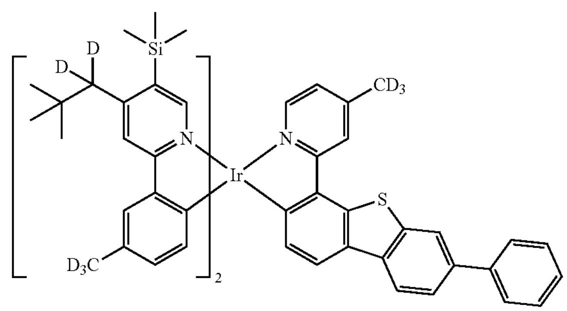
2543
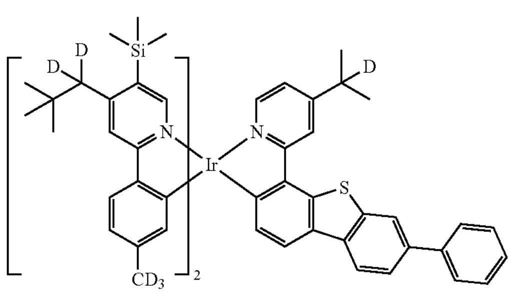
2544
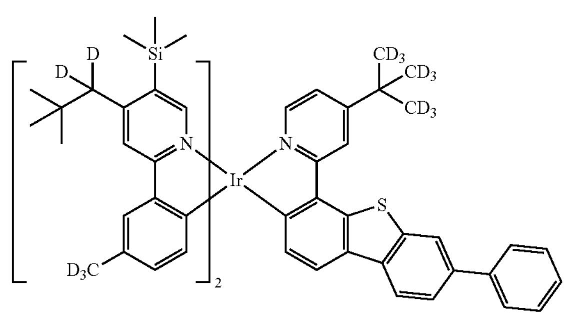
2545
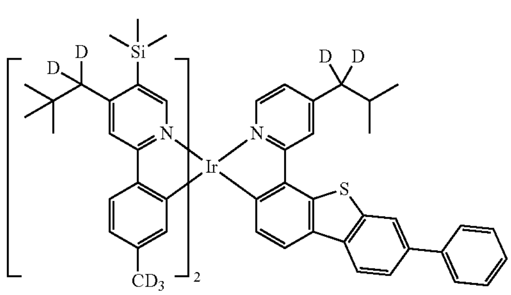
2546
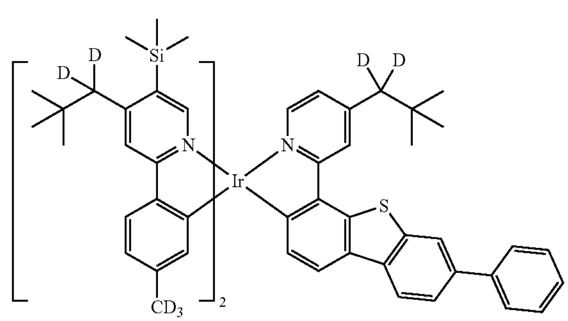

-continued
2547
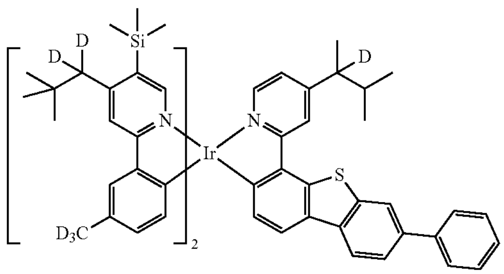
2548
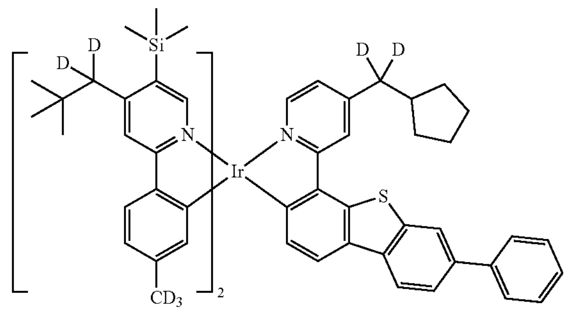
2549
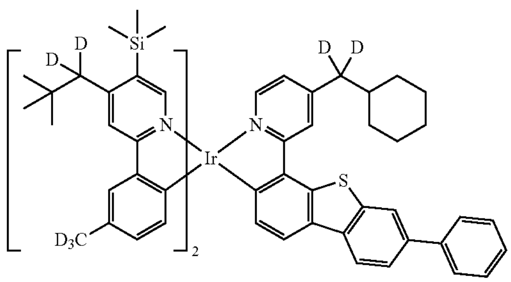
2550
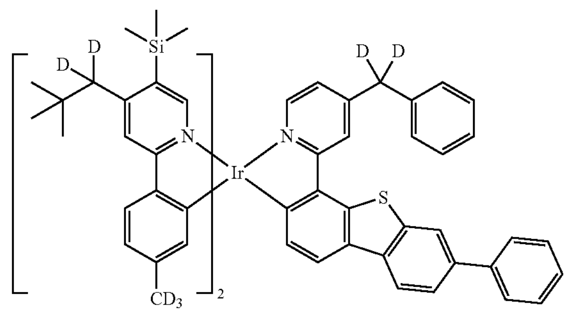
2551
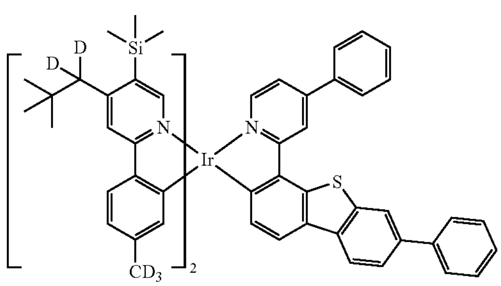
2552
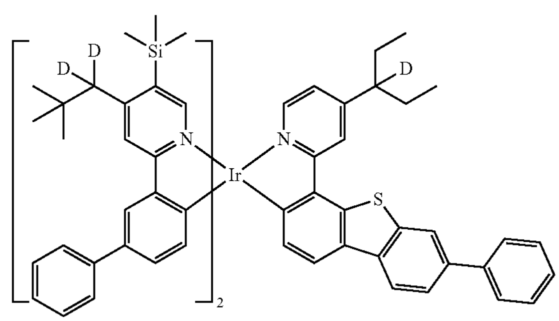
2553
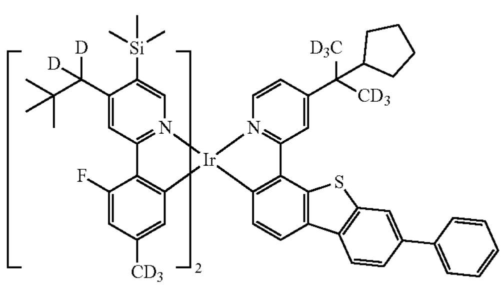
2554
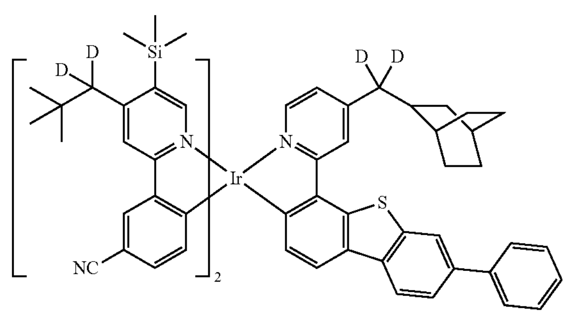

-continued
2555
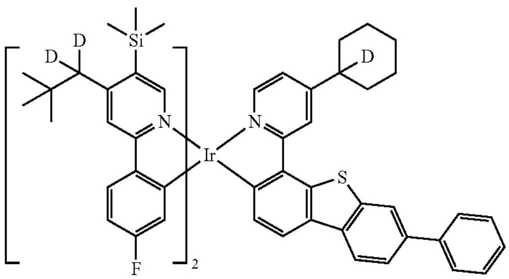
2556
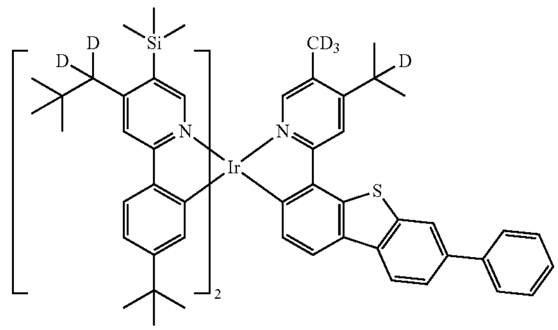
2557
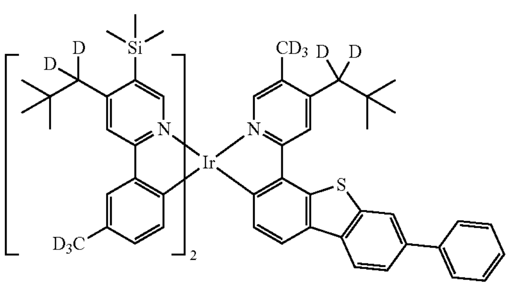
2558
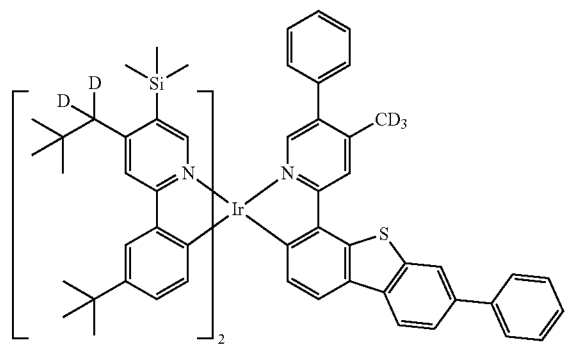
2559
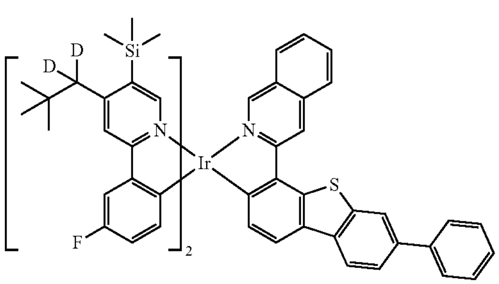
2560
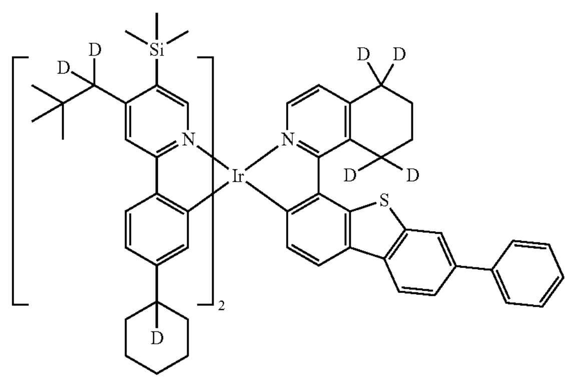
2561
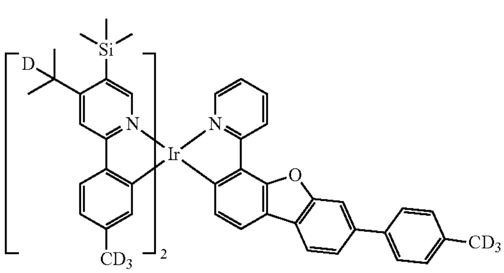
2562
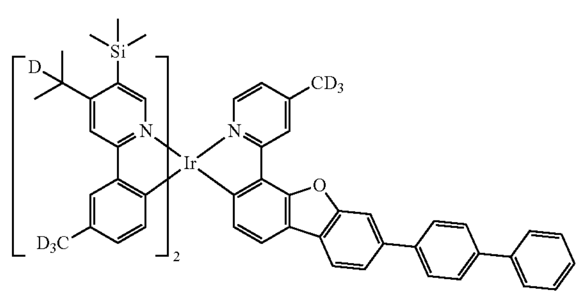

-continued
2563
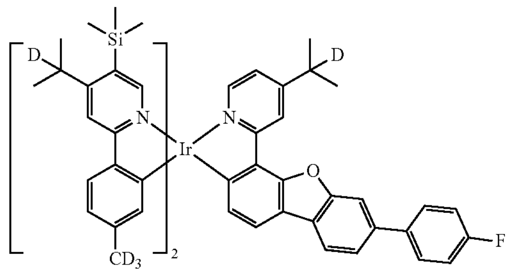
2564
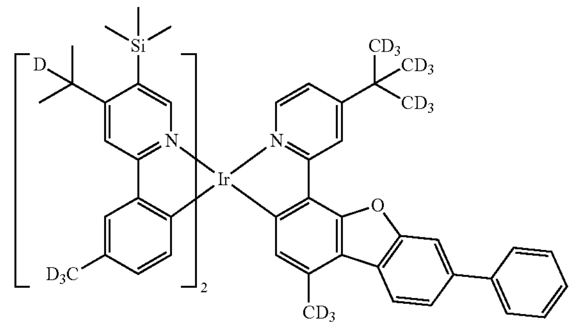
2565
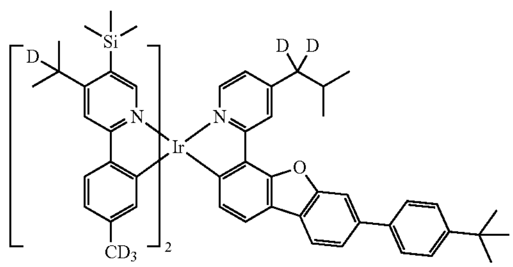
2566
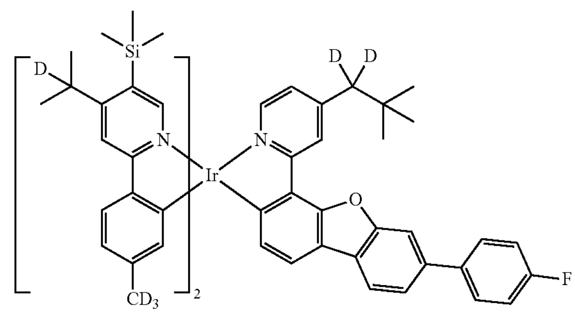
2567
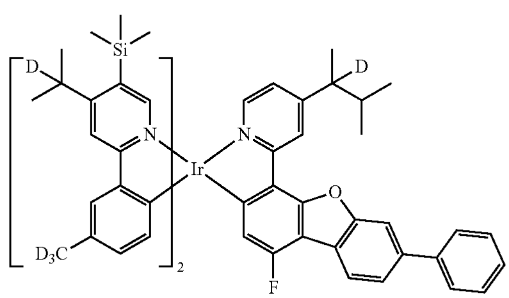
2568
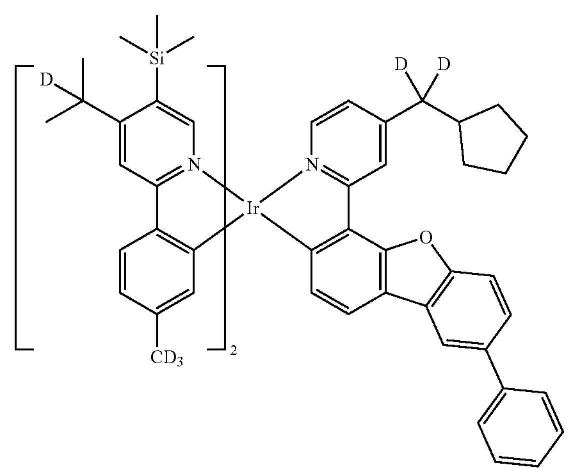
2569
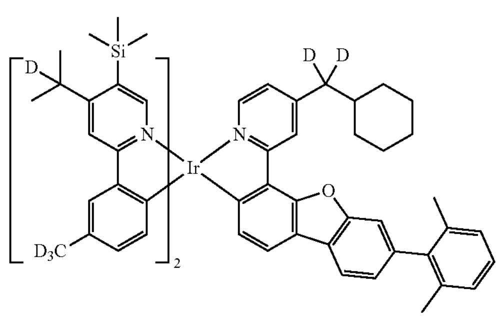
2570
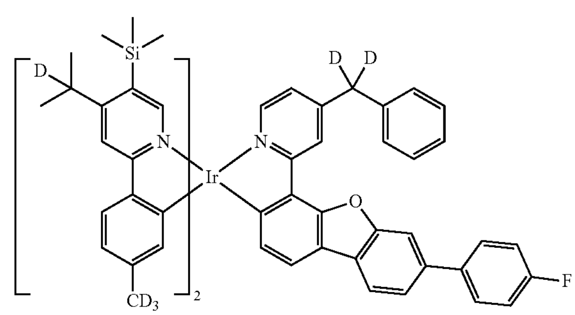

-continued
2571
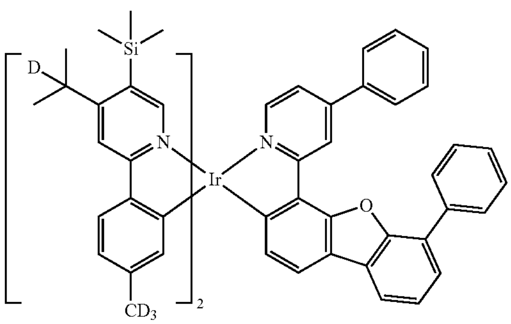
2572
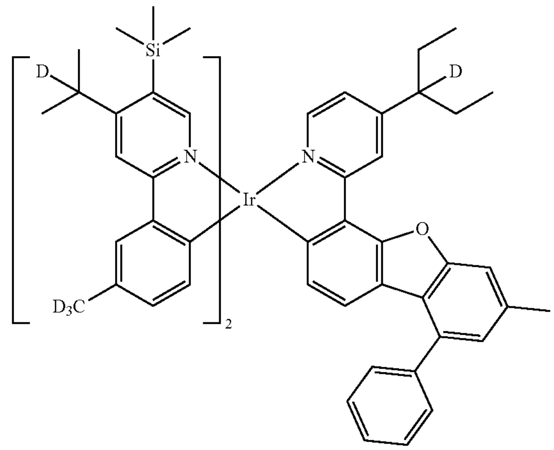
2573
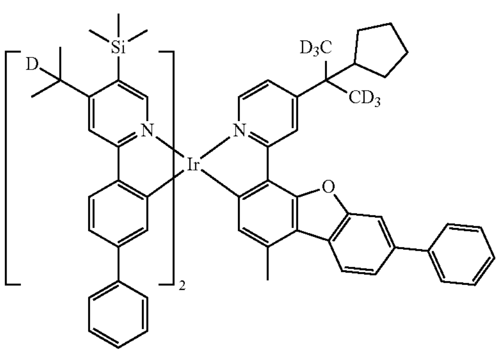
2574
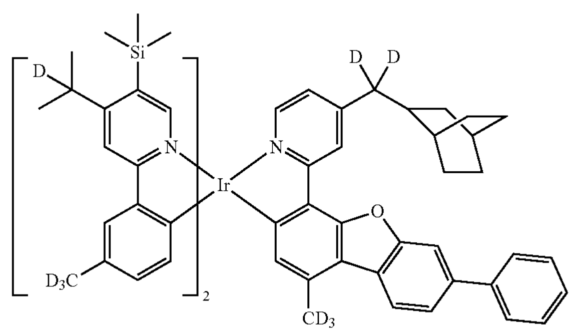
2575
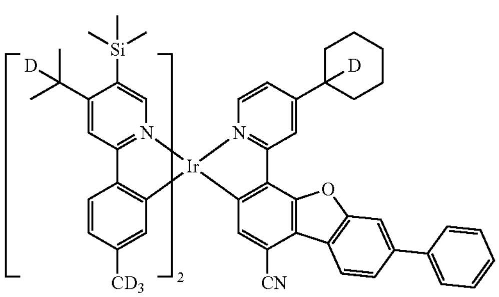
2576
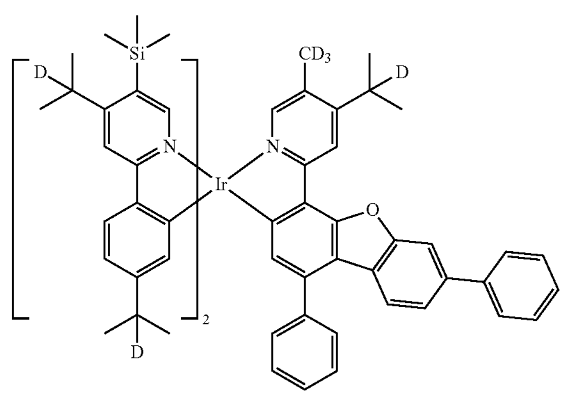

-continued
2577
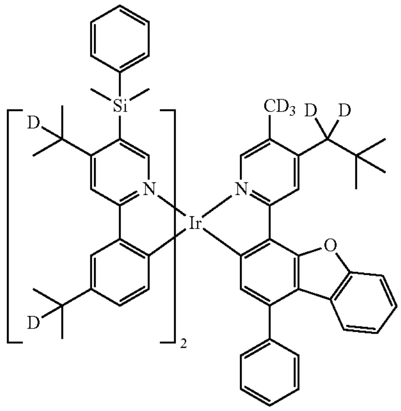
2578
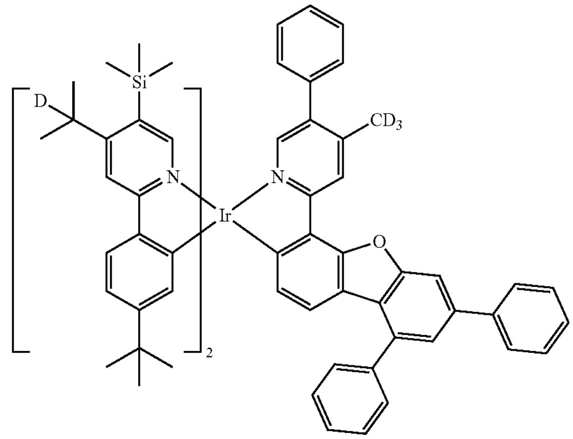
2579
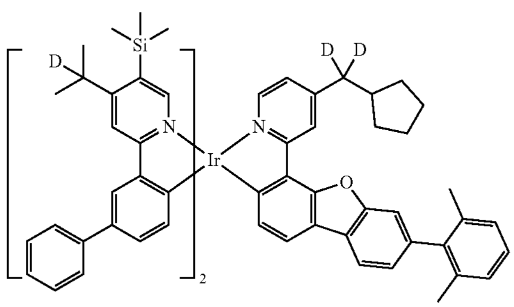
2580
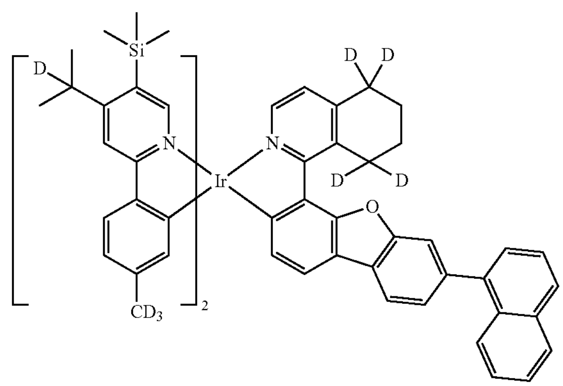
2581
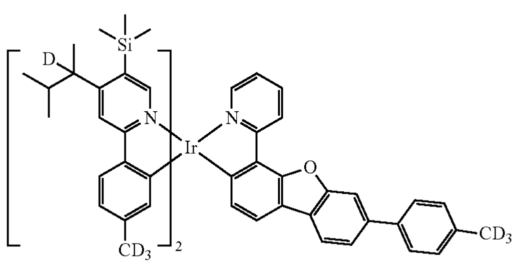
2582
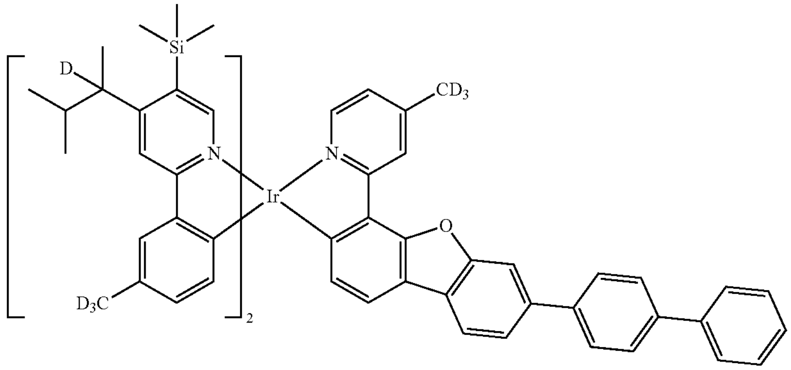

-continued
2583
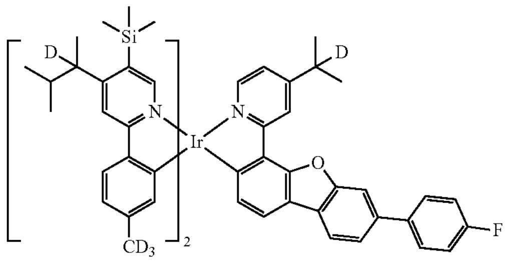
2584
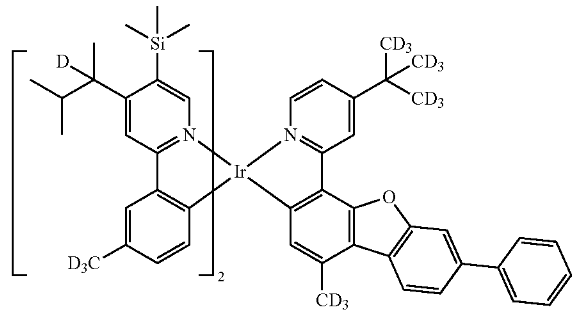
2585
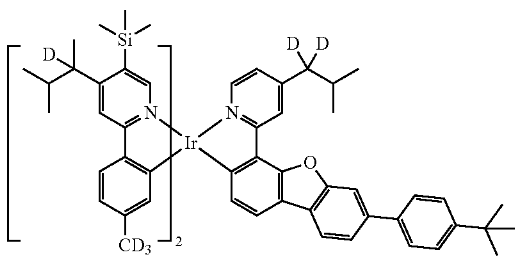
2586
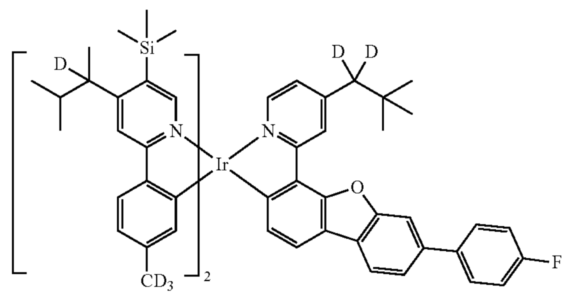
2587
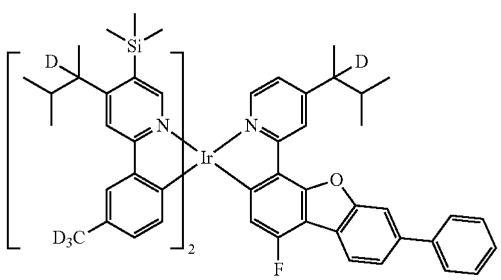
2588
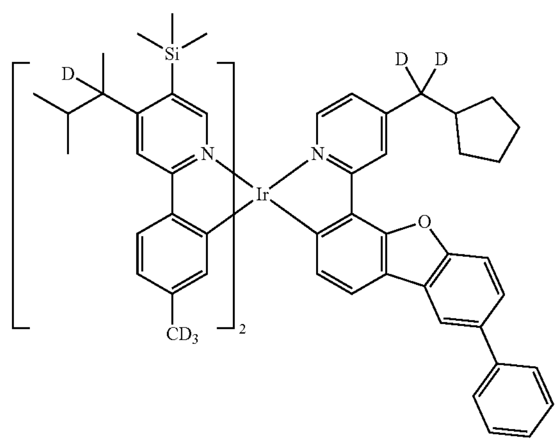
2589
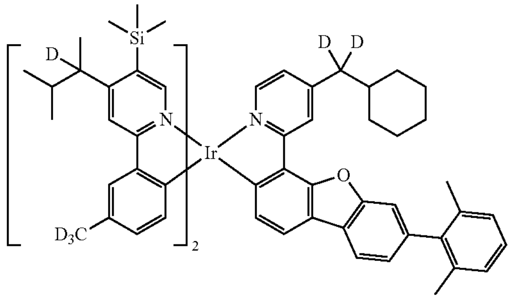
2590
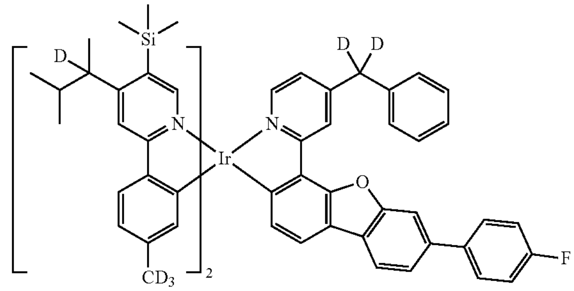

-continued
2591
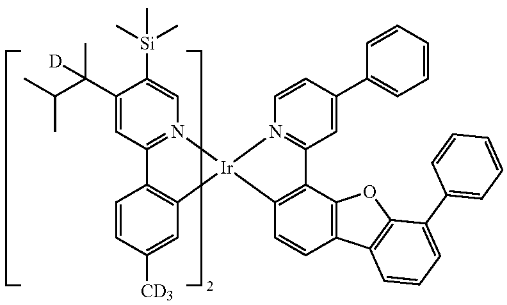
2592
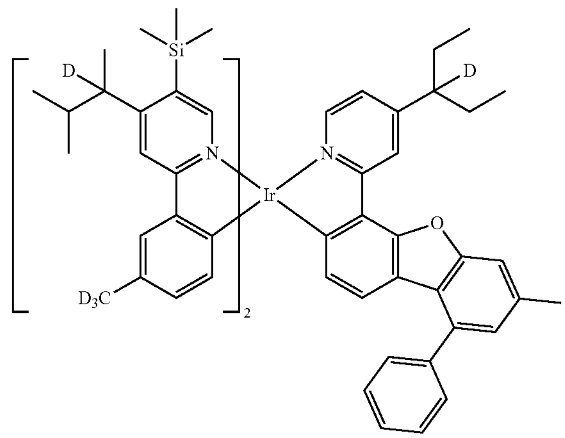
2593
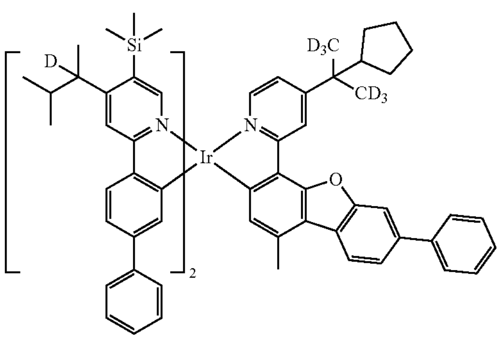
2594
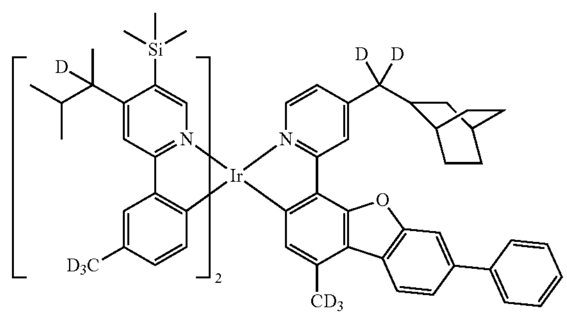
2595
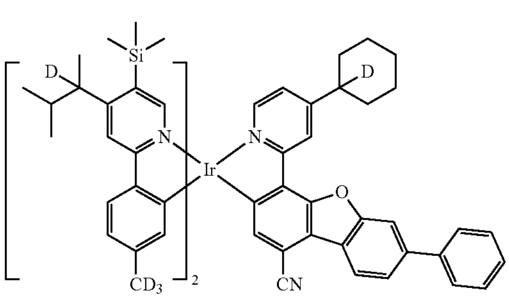
2596
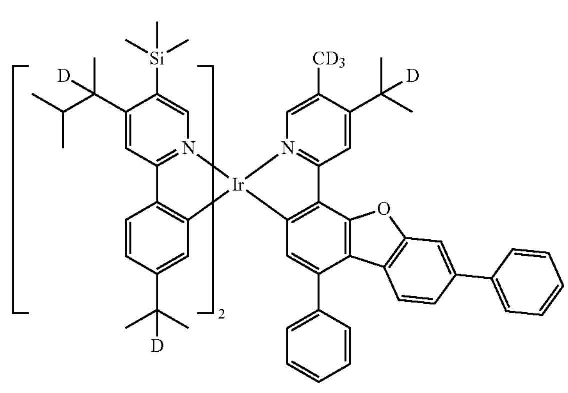

-continued
2597
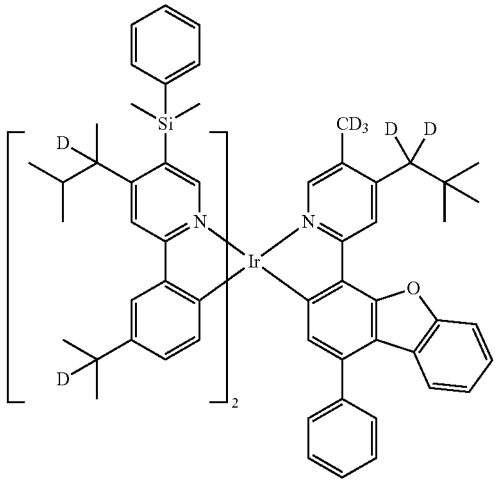
2598
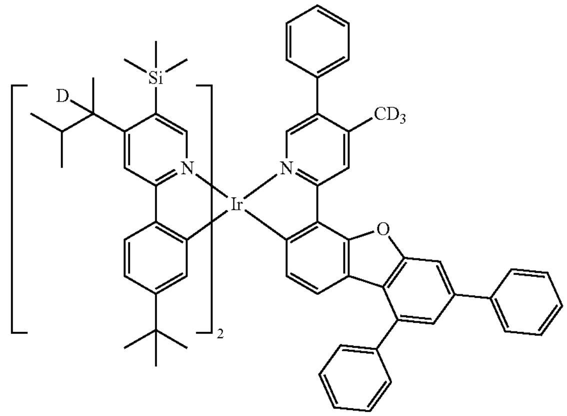
2599
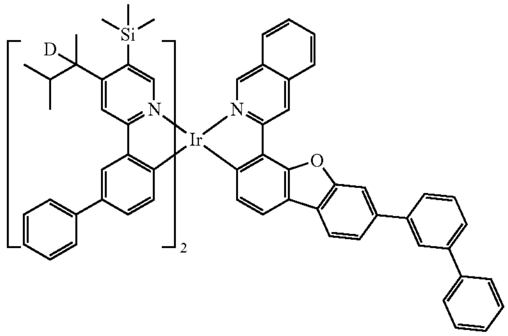
2600
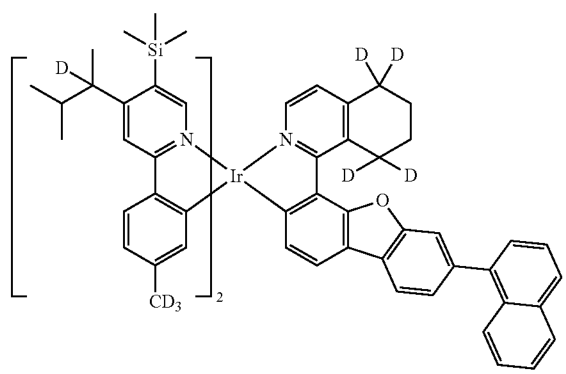
2601
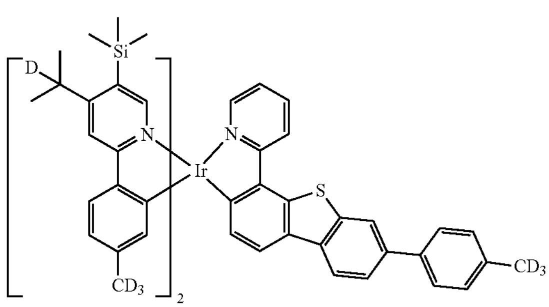
2602
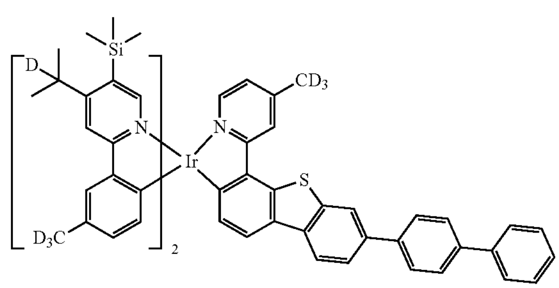

-continued
2603
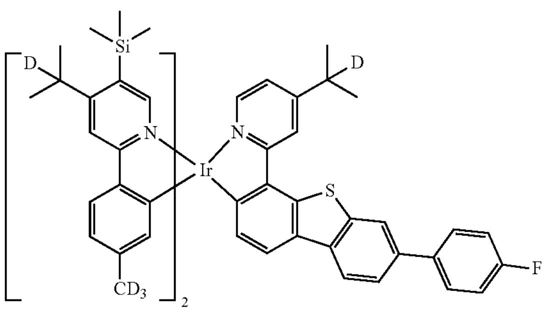
2604
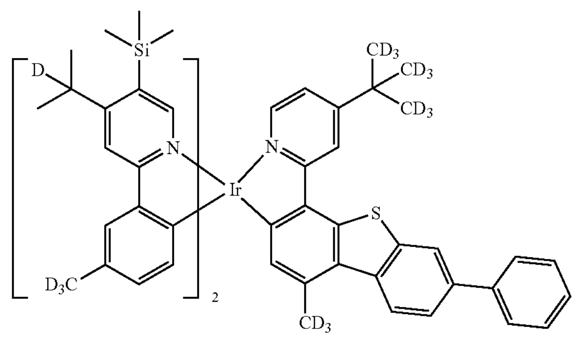
2605
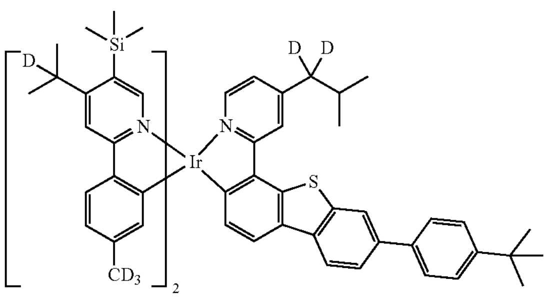
2606
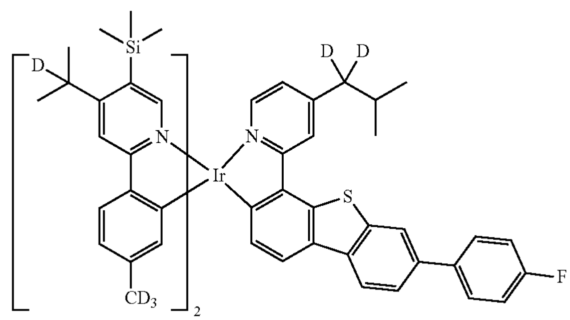
2607
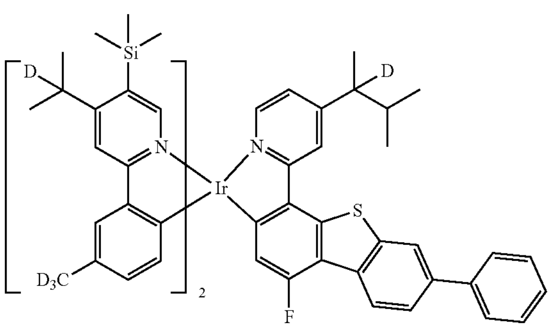
2608
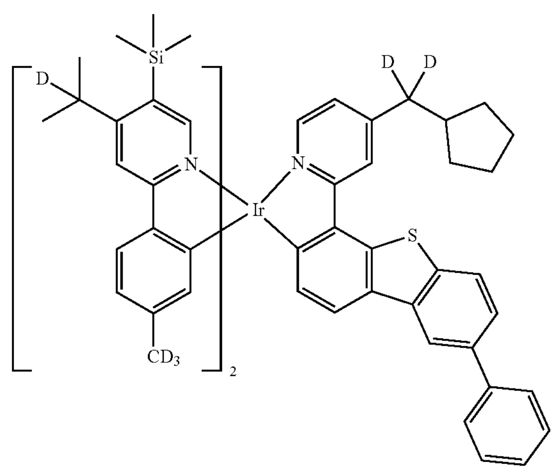
2609
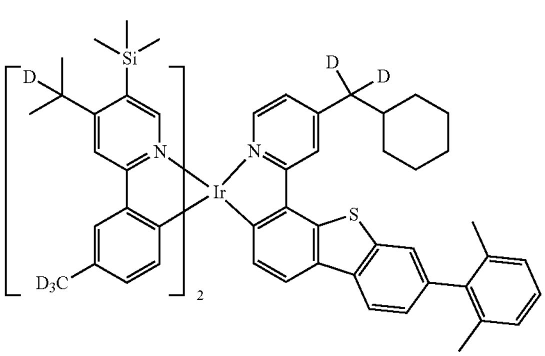
2610
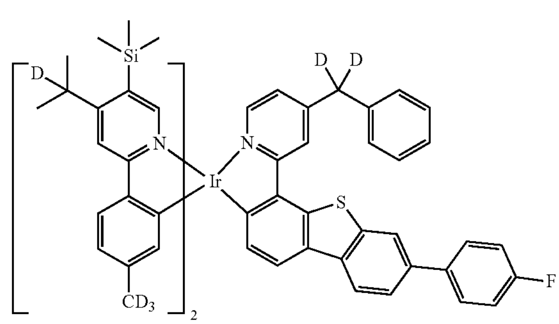

-continued
2611
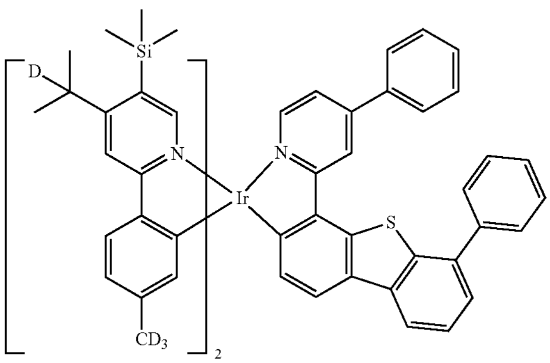
2612
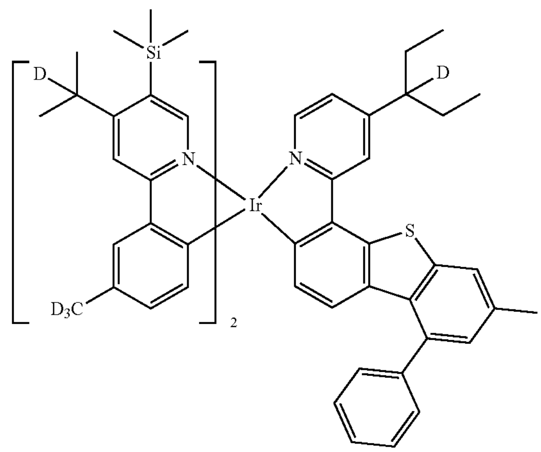
2613
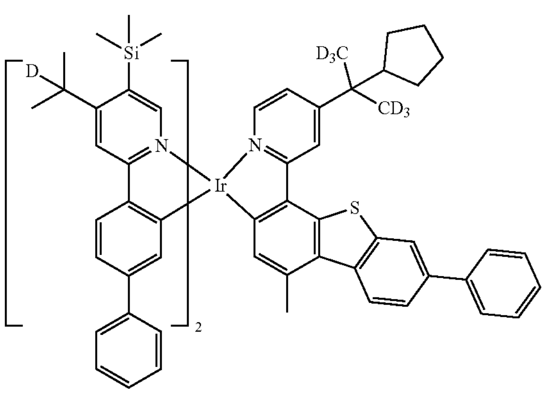
2614
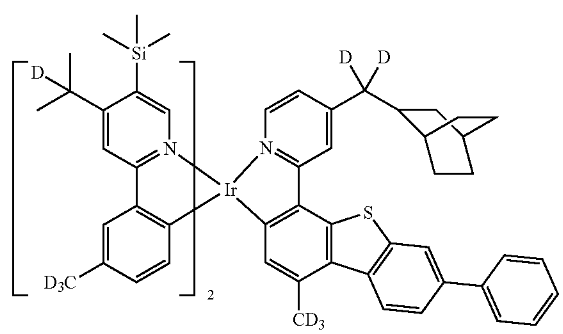
2615
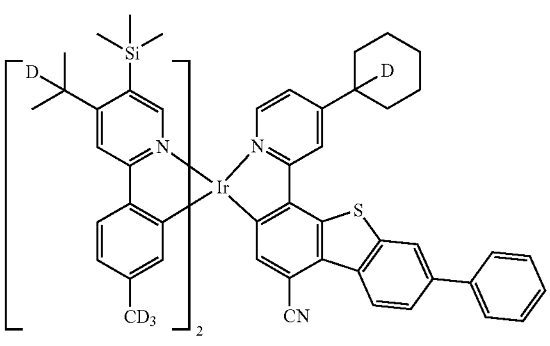
2616
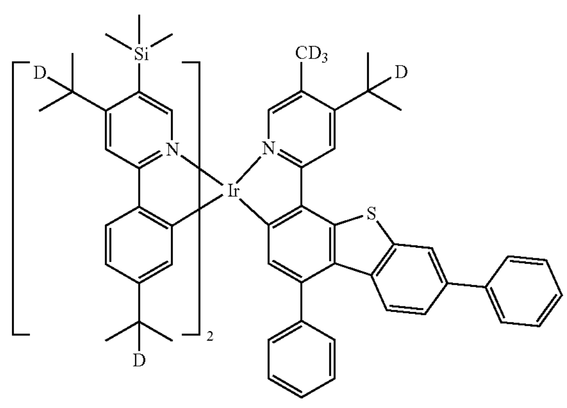

-continued
2617
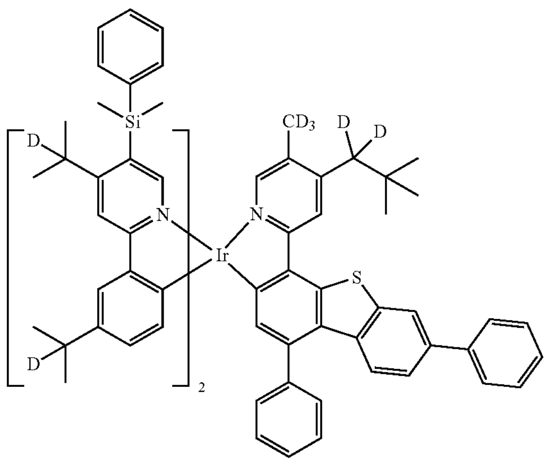
2618
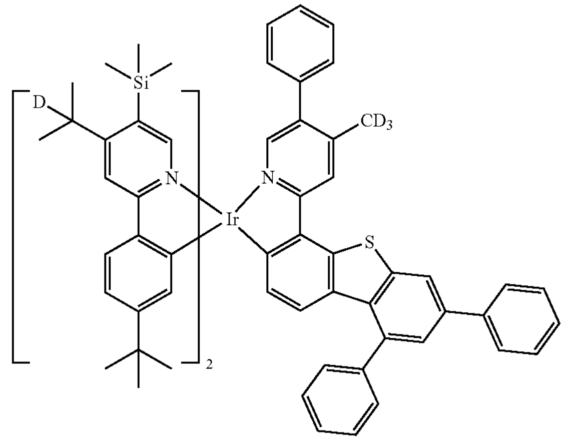
2619
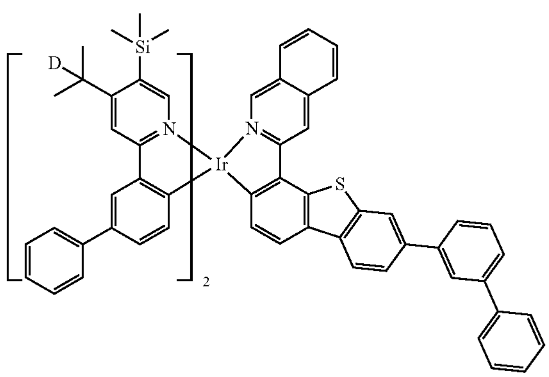
2620
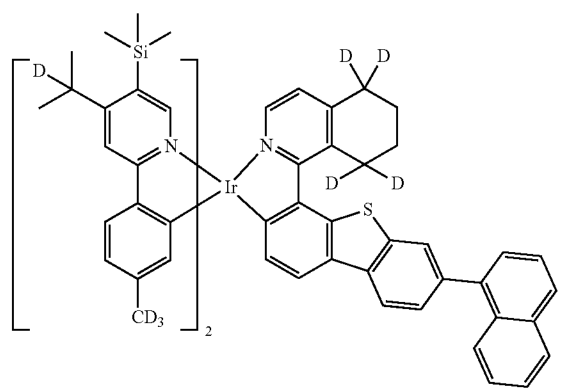
2621
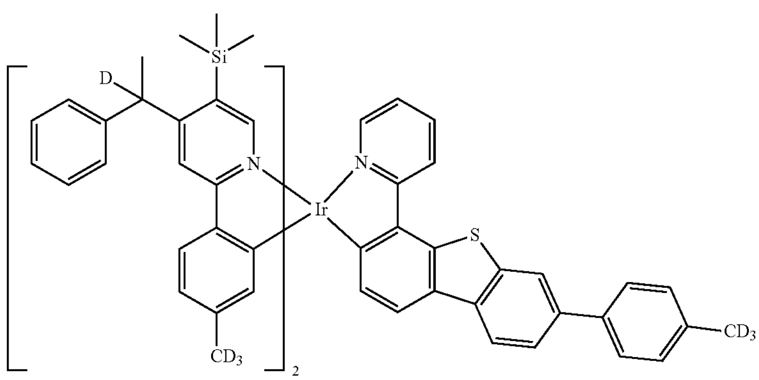
2622
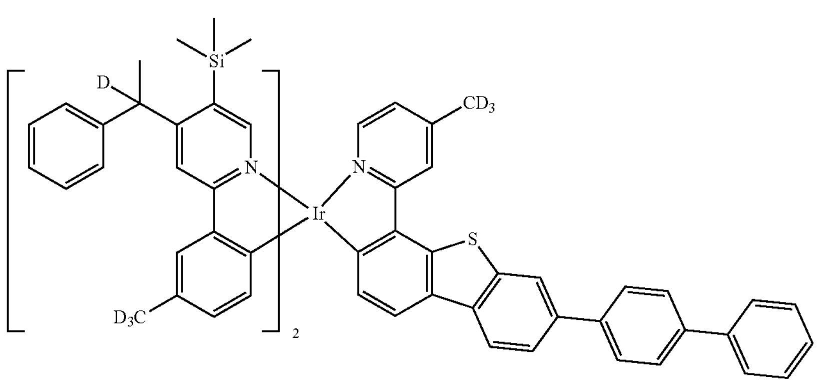

-continued
2623
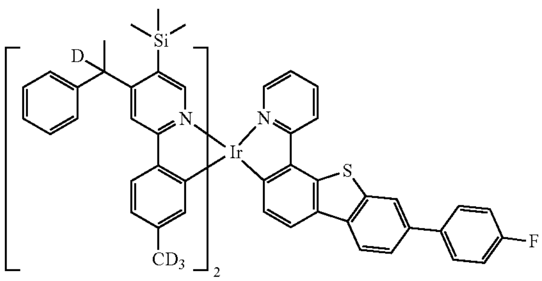
2624
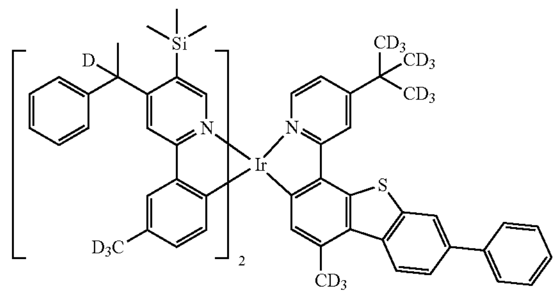
2625
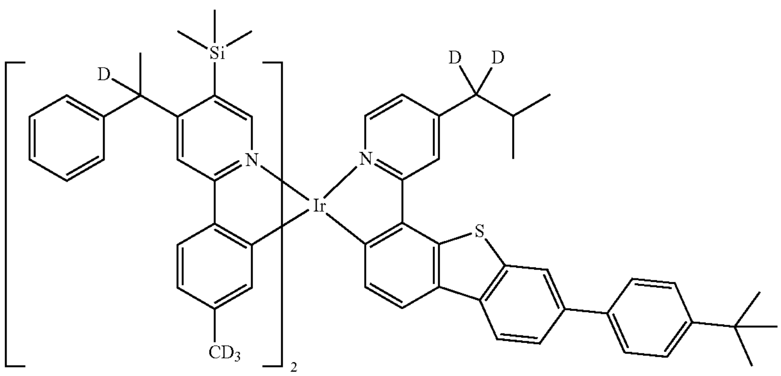
2626
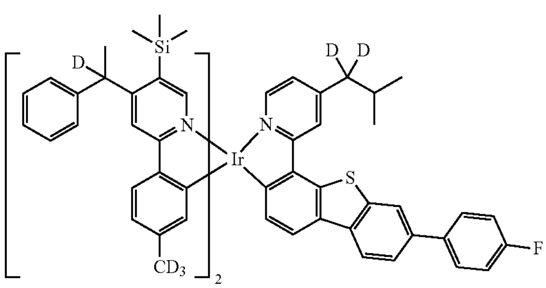
2627
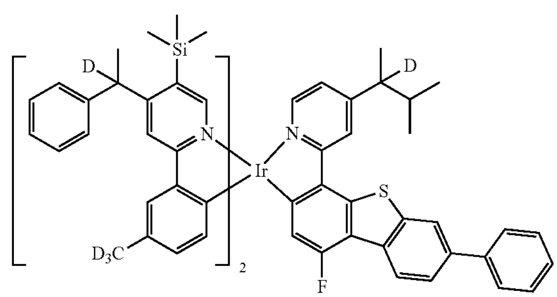
2628
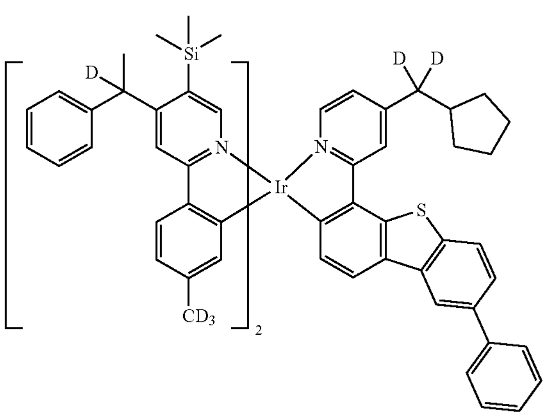
2629
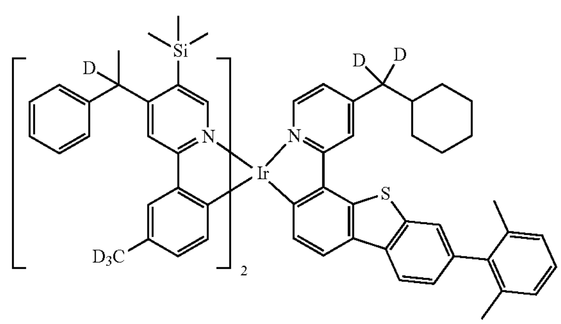

-continued
2630
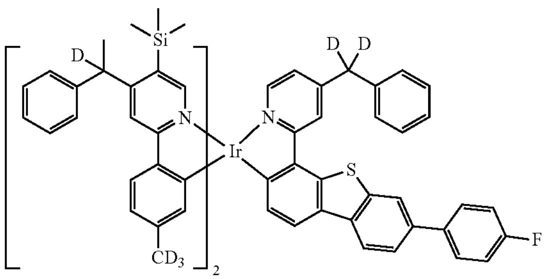
2631
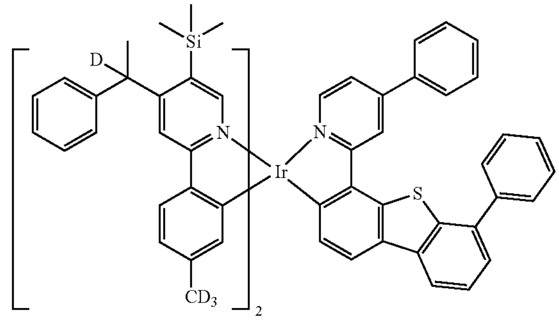
2632
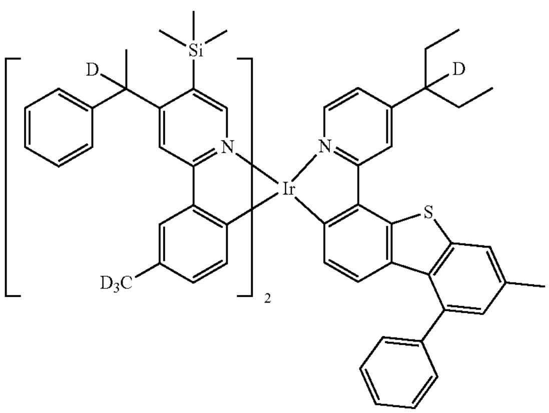
2633
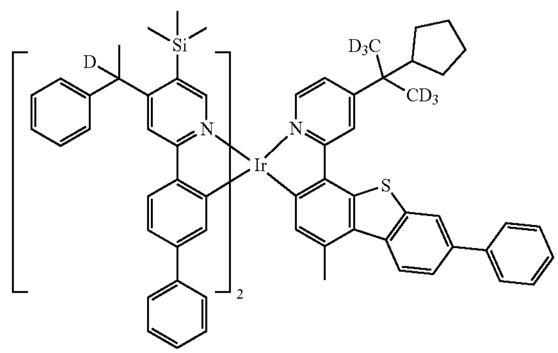
2634
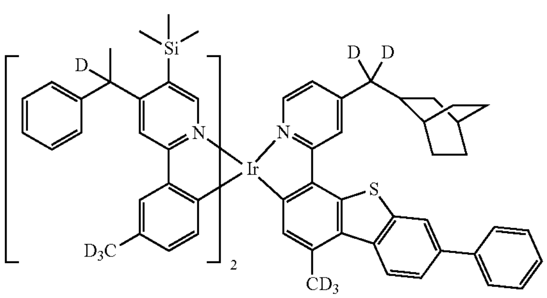
2635
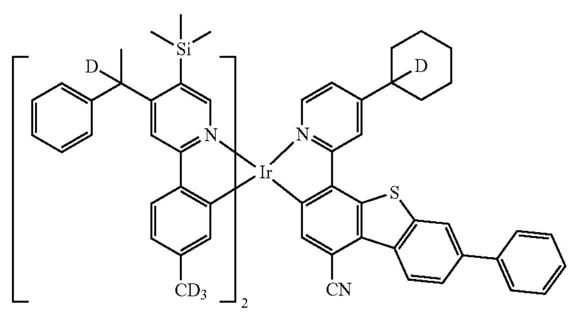
2636
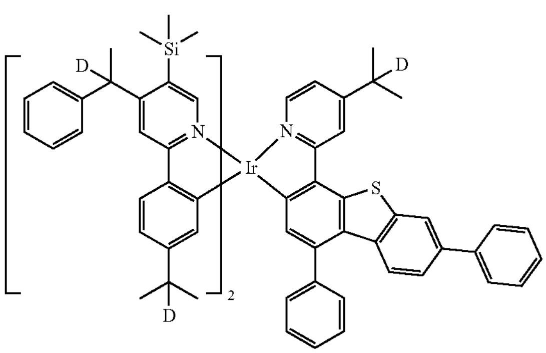
2637
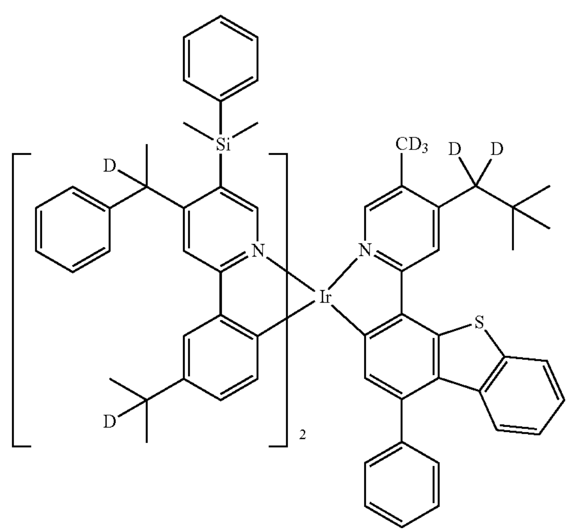

-continued
2638
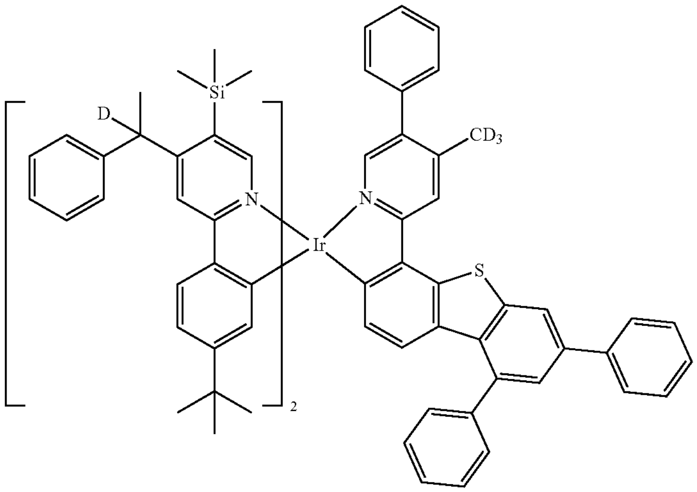
2639
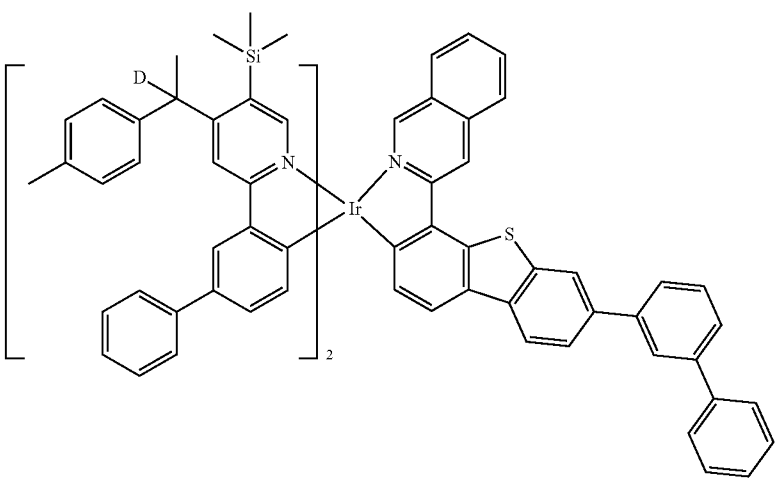
2640
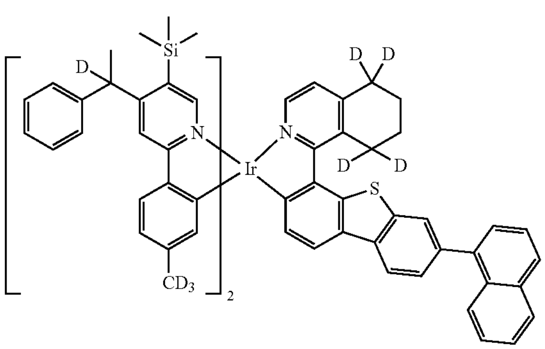
2641
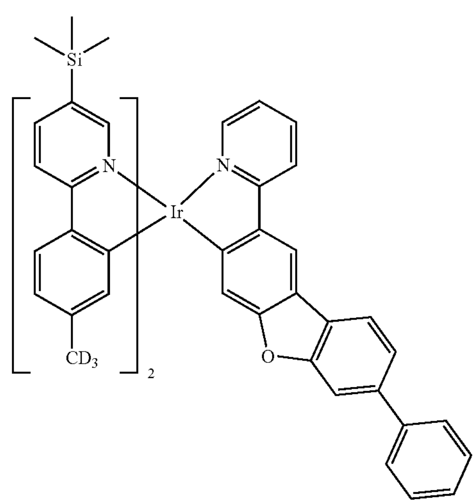

-continued
2642
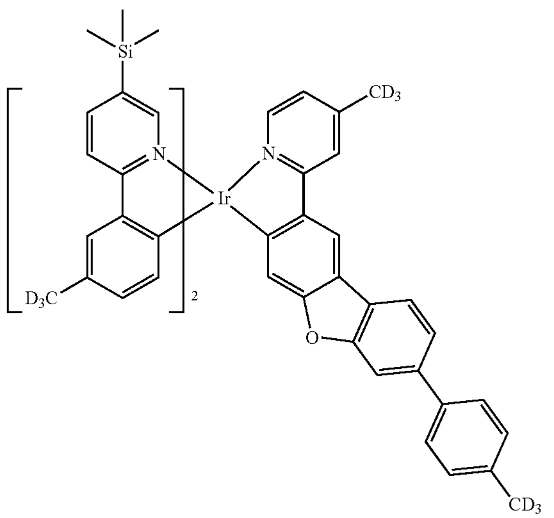
2643
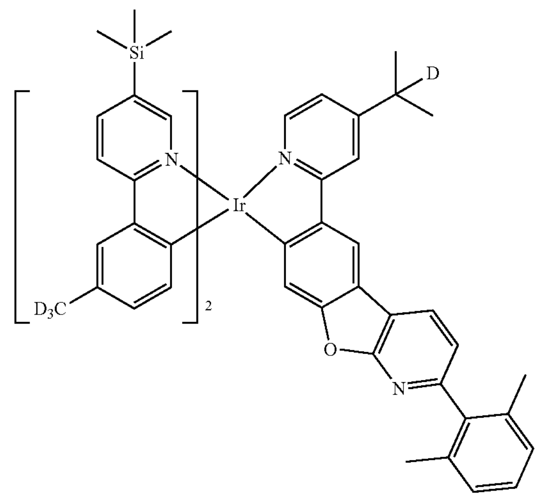
2644
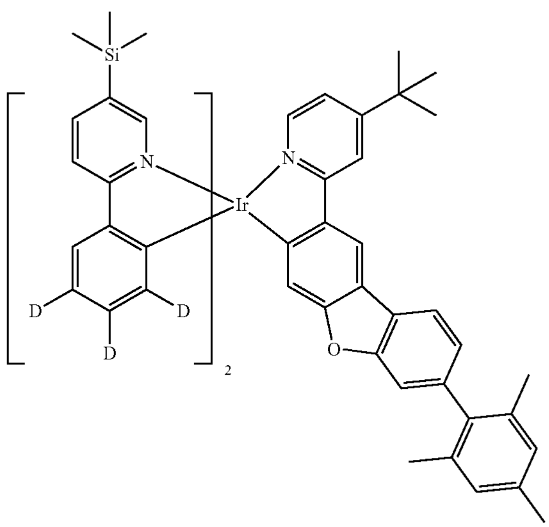
2645
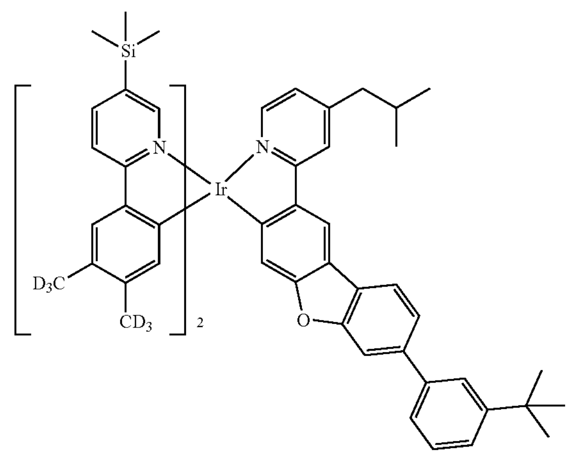
2646
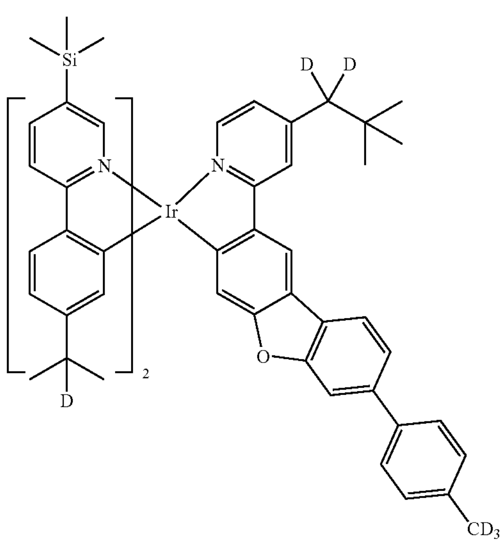
2647
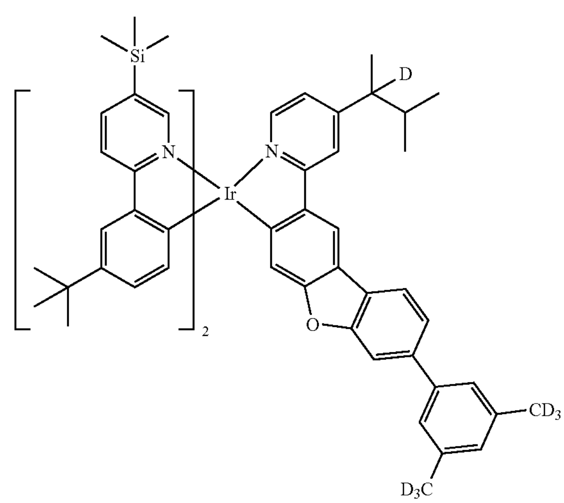

-continued
2648
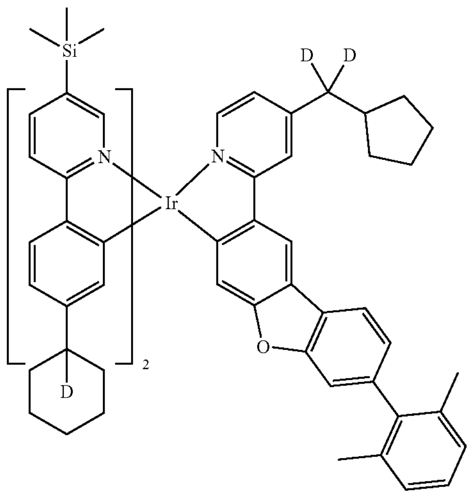
2649
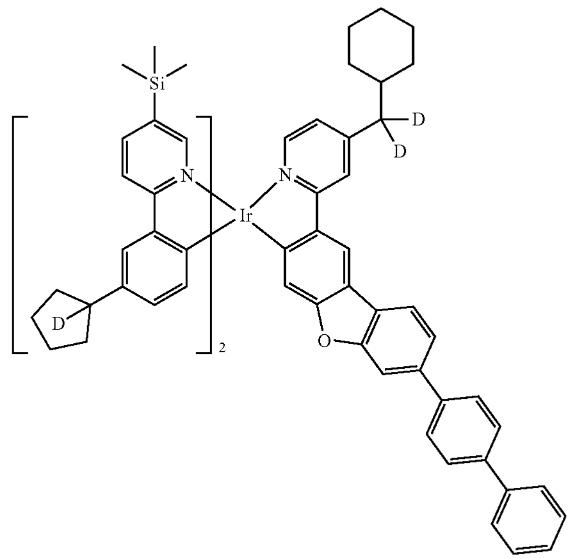
2650
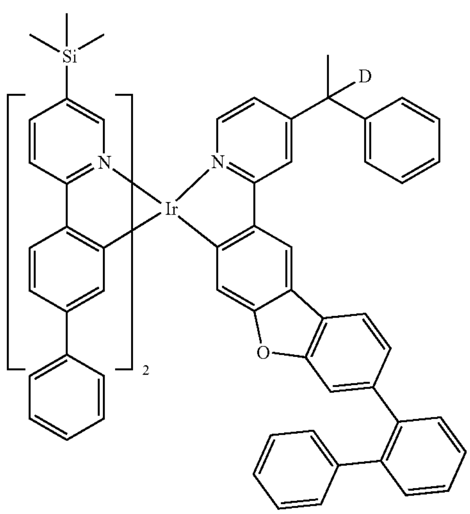
2651
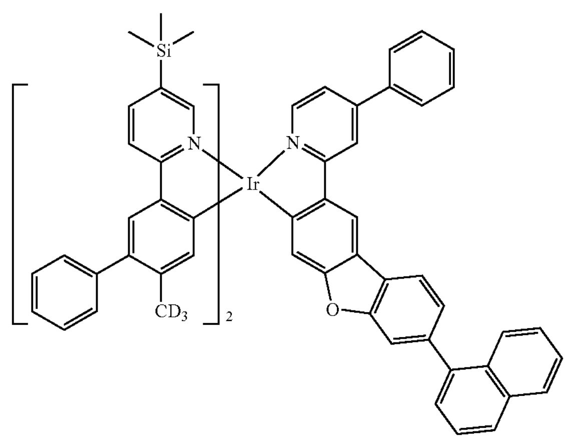
2652
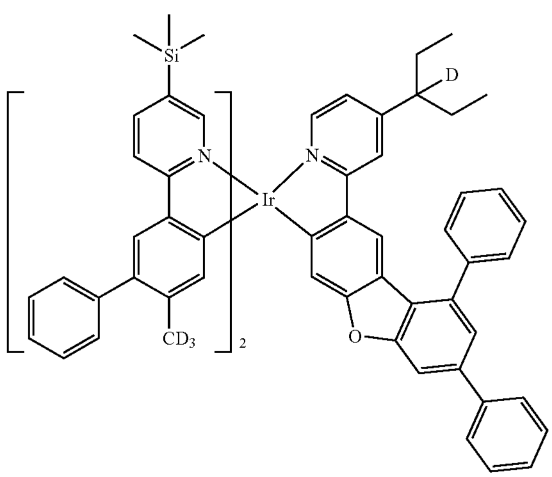
2653
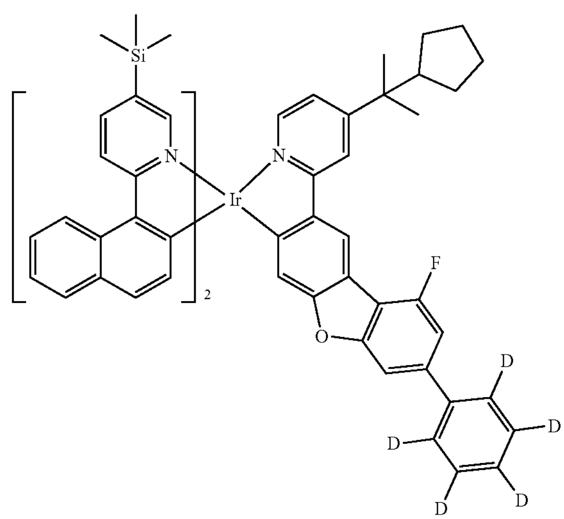

-continued
2654
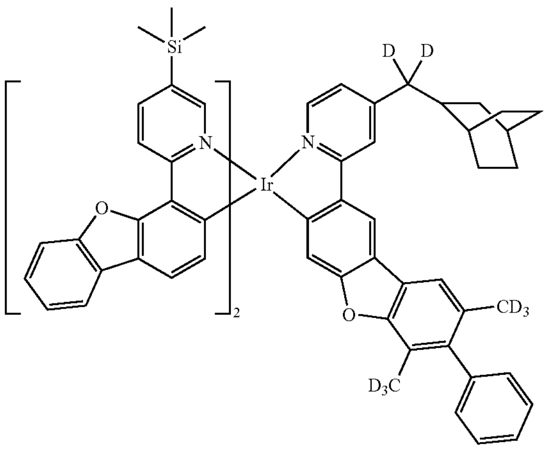
2655
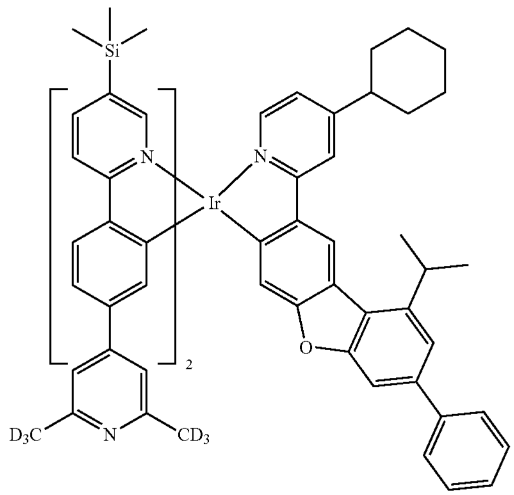
2656
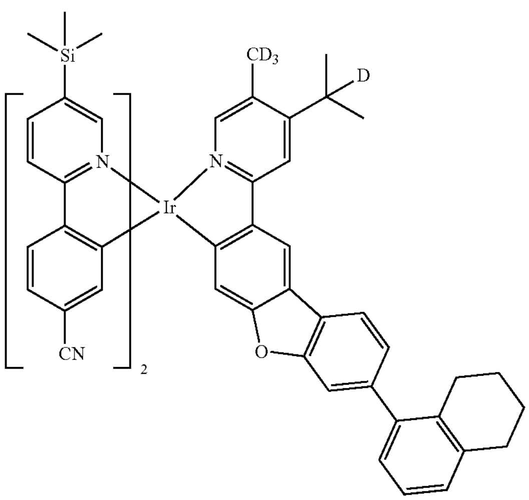
2657
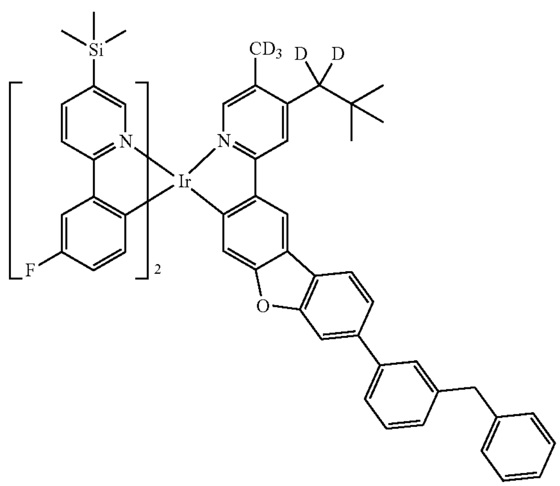
2658
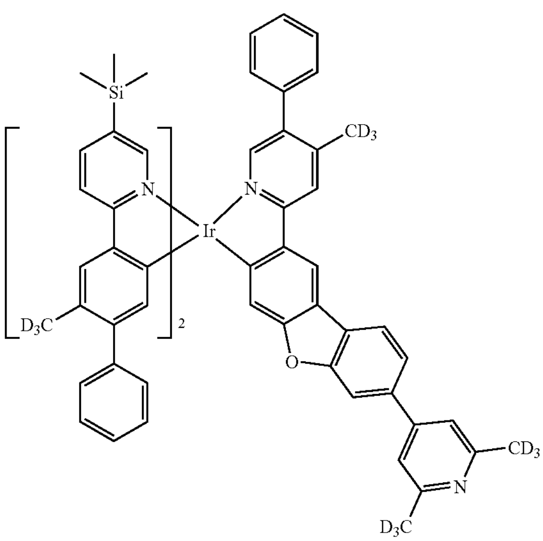
2659
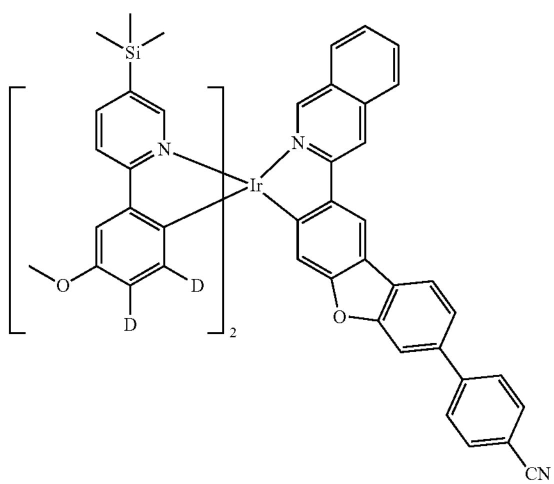

-continued
2660
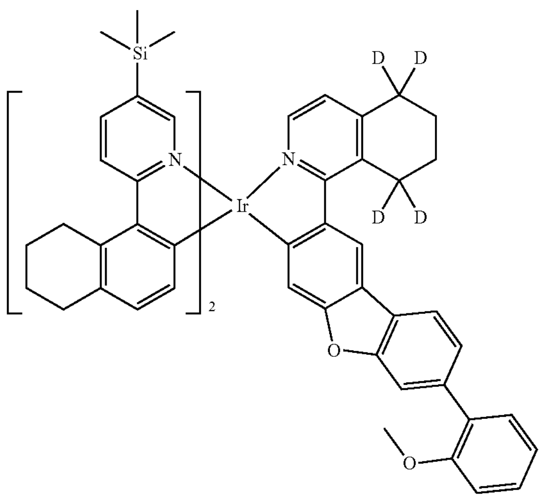
2661
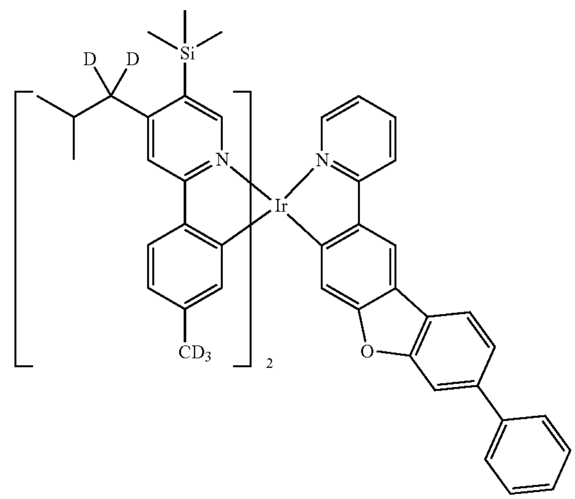
2662
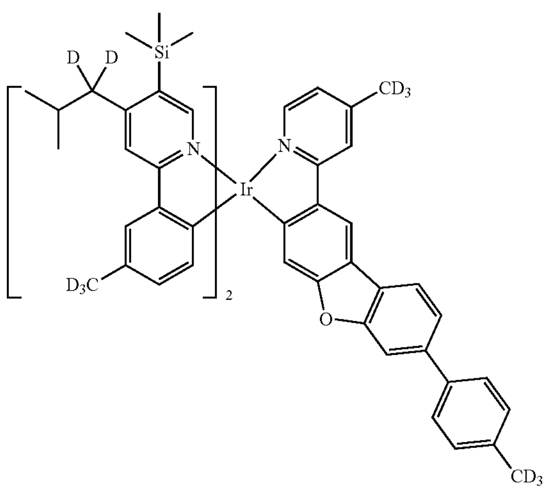
2663
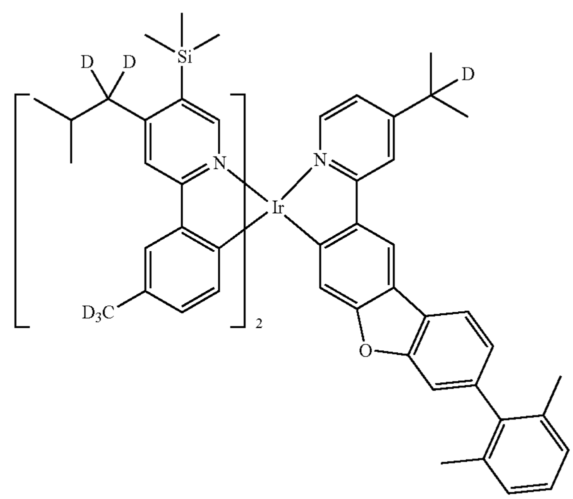
2664
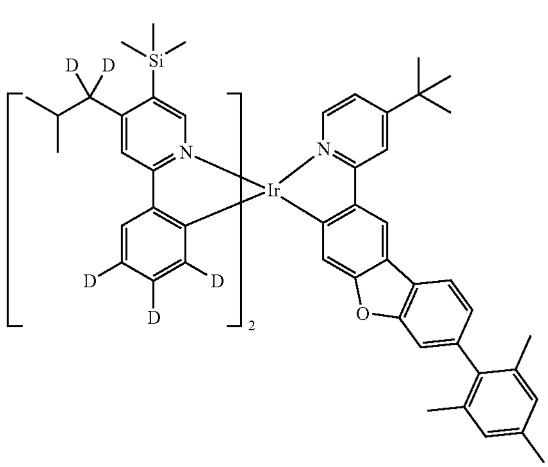
2665
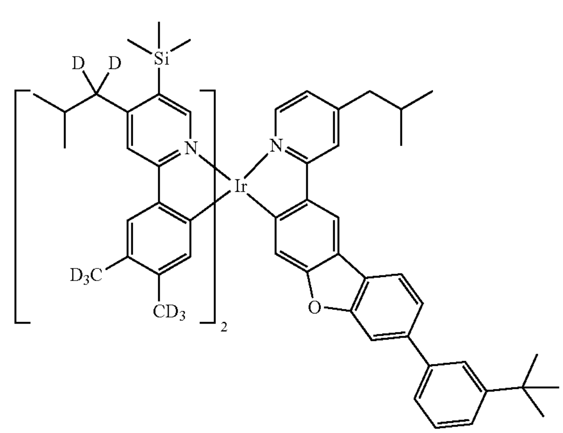

-continued
2666
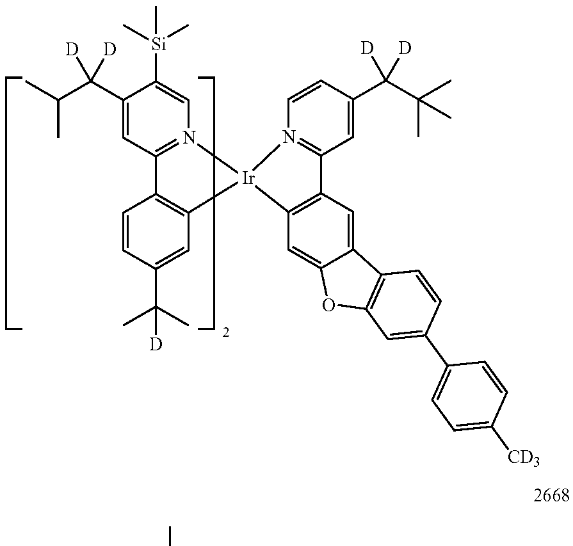
2667
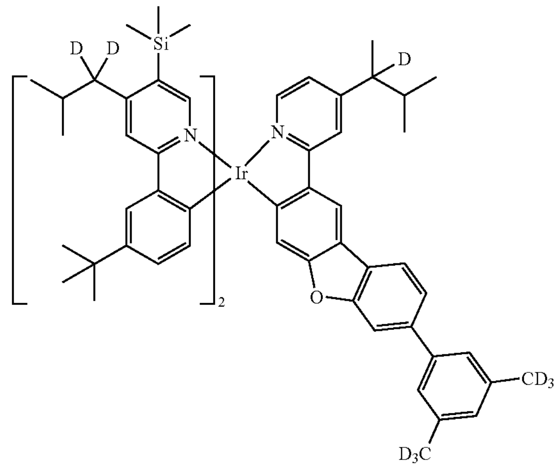
2668
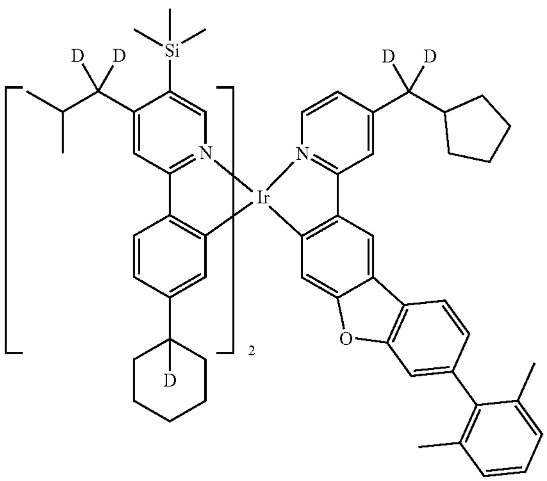
2669
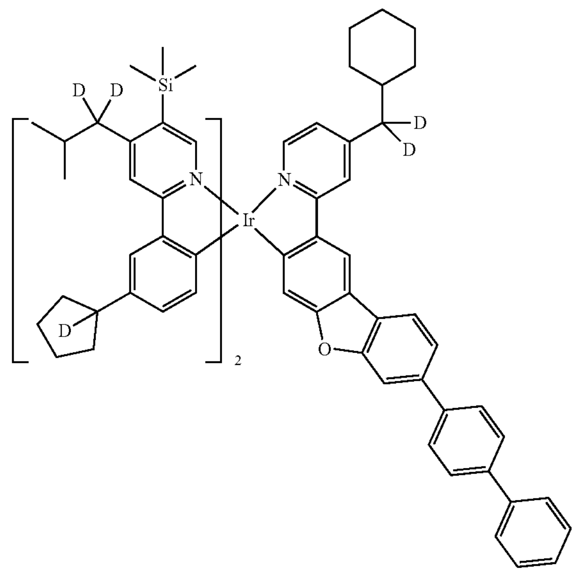
2670
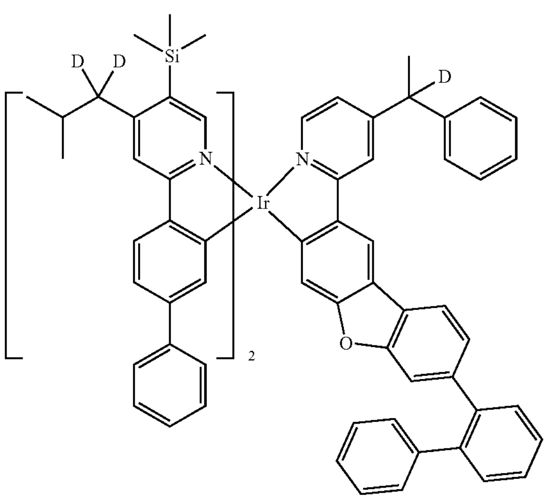
2671
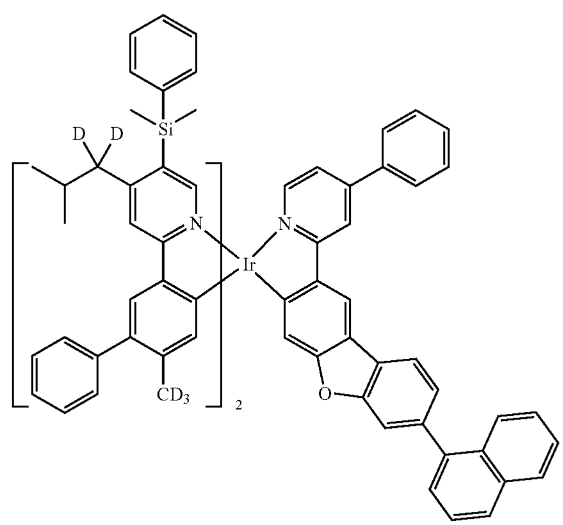

-continued
2672
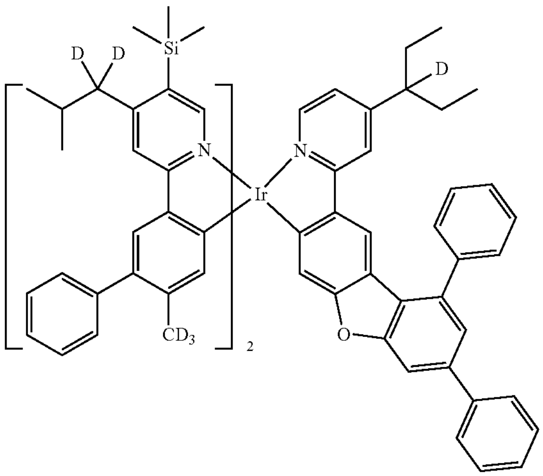
2673
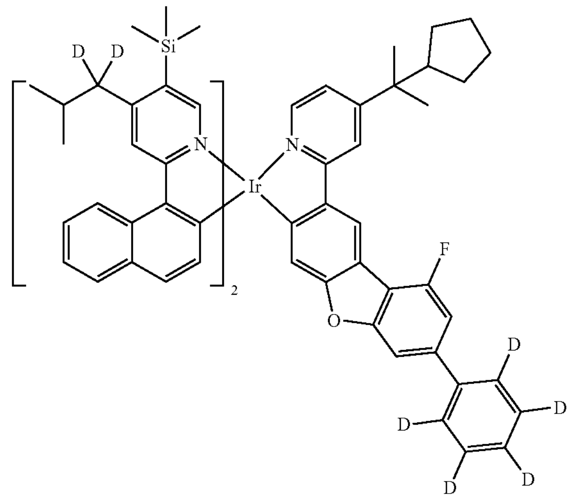
2674
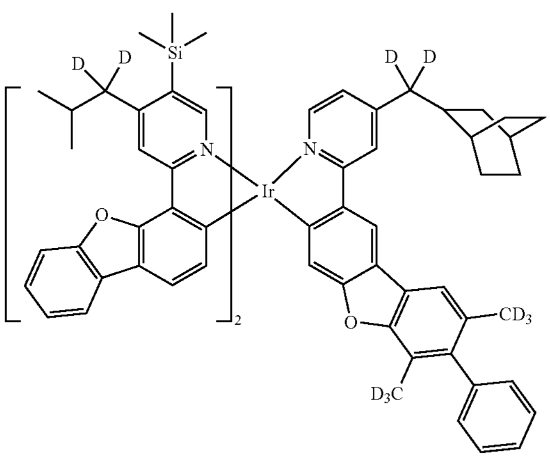
2675
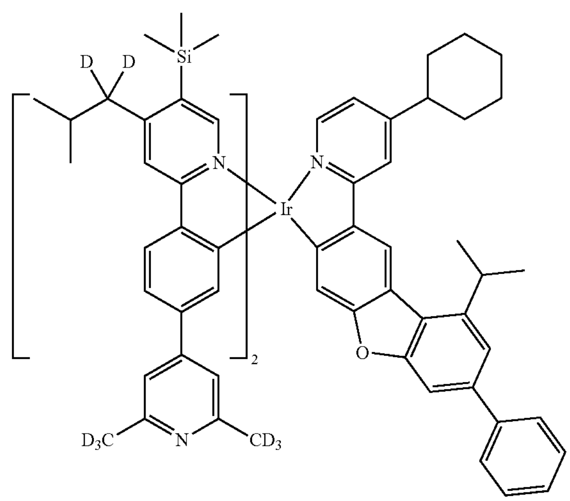
2676
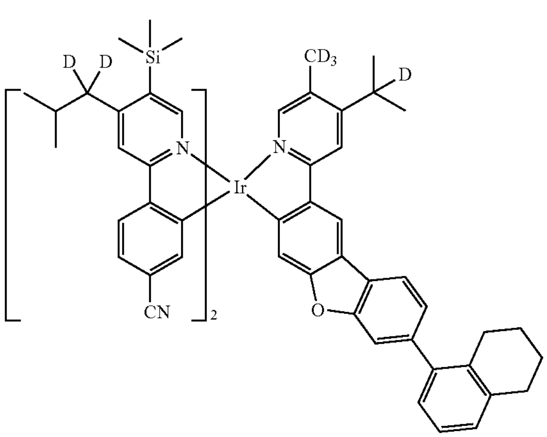
2677
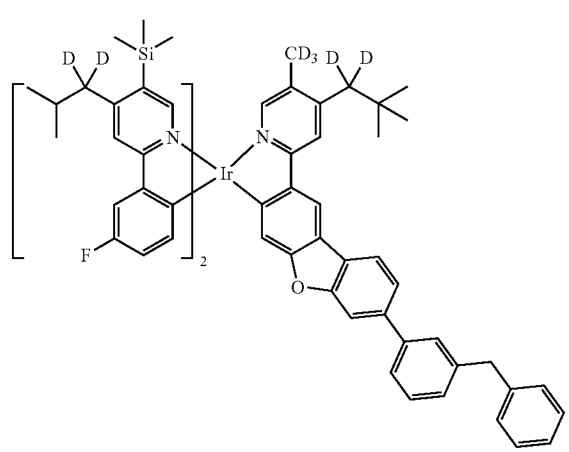

-continued
2678
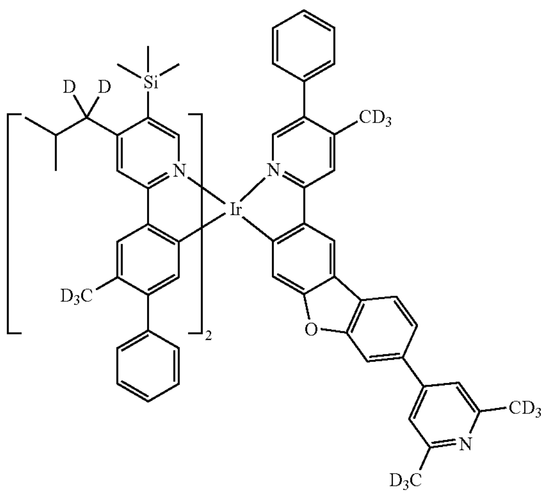
2679
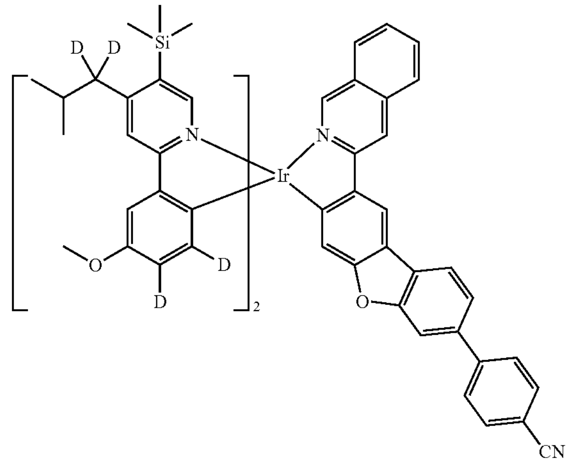
2680
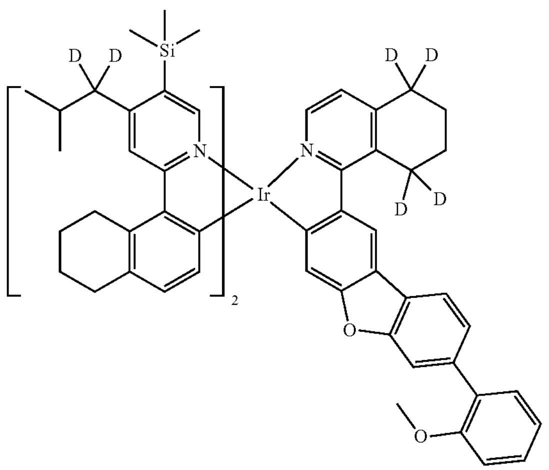
2681
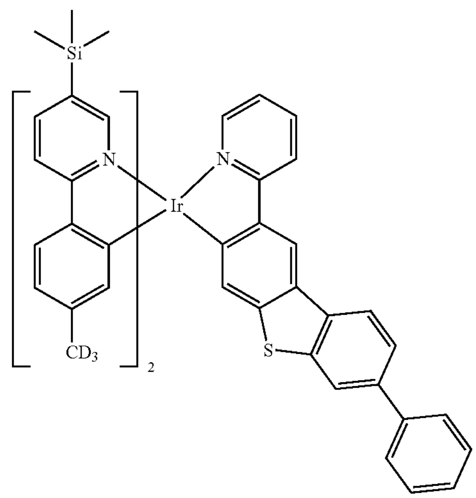
2682
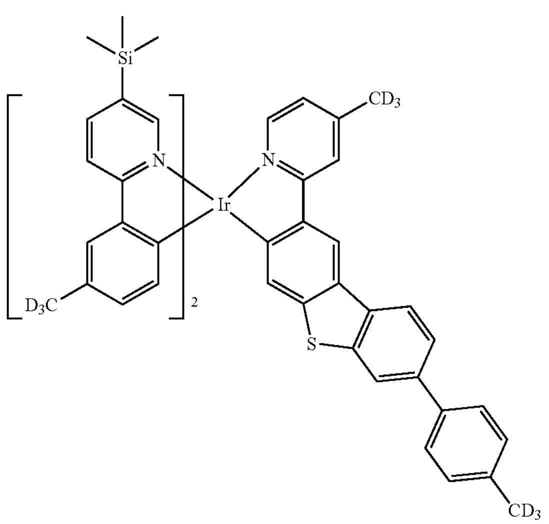
2683
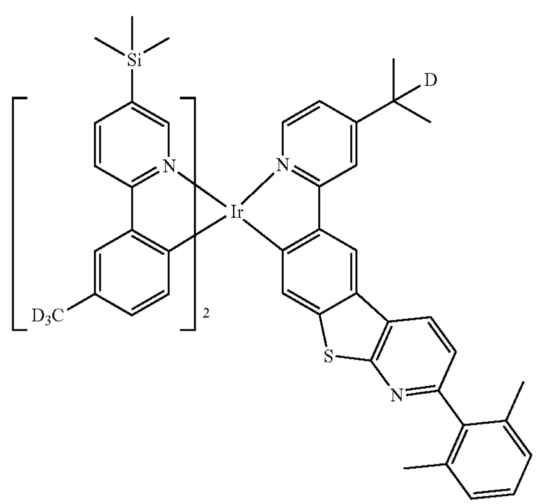

-continued
2684
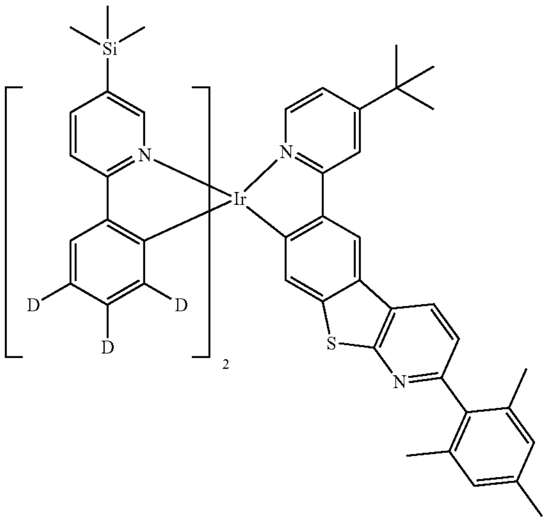
2685
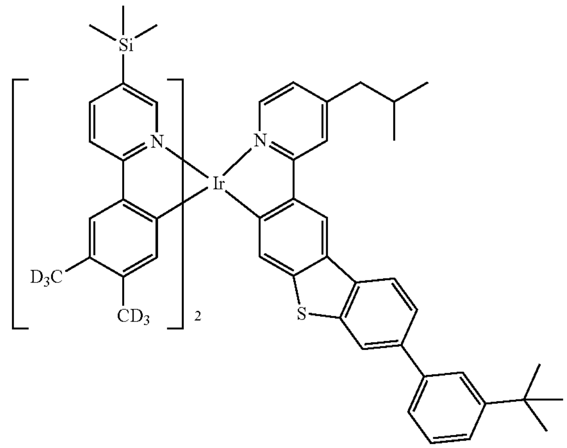
2686
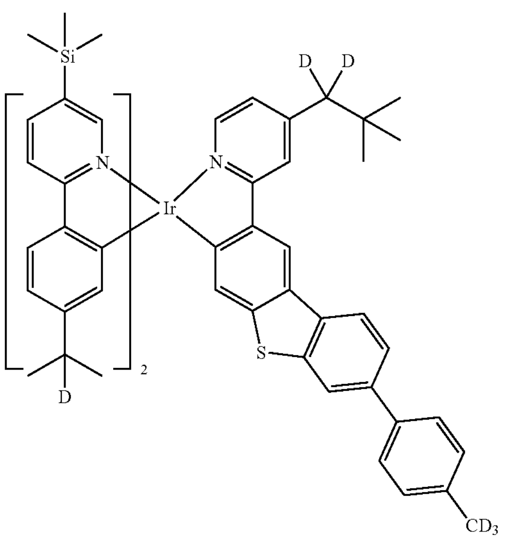
2687
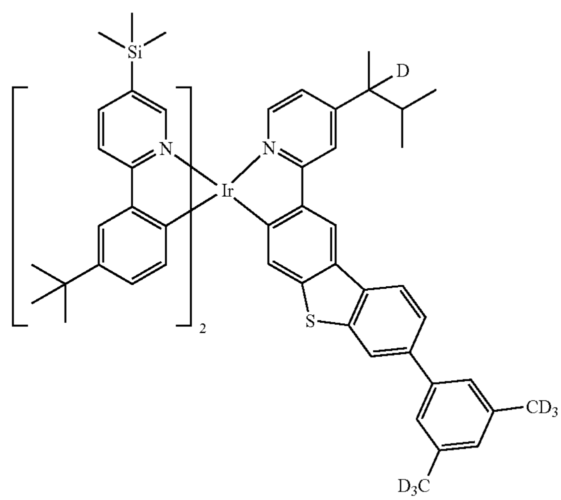
2688
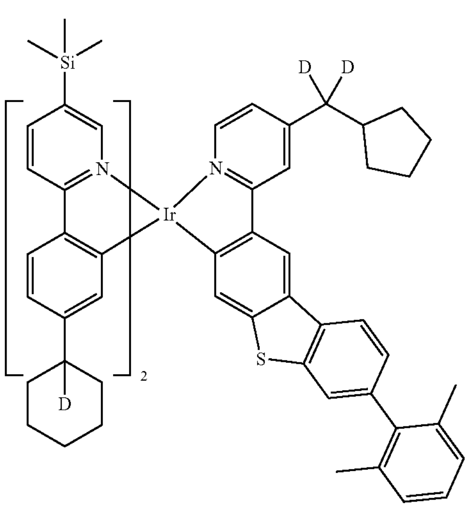
2689
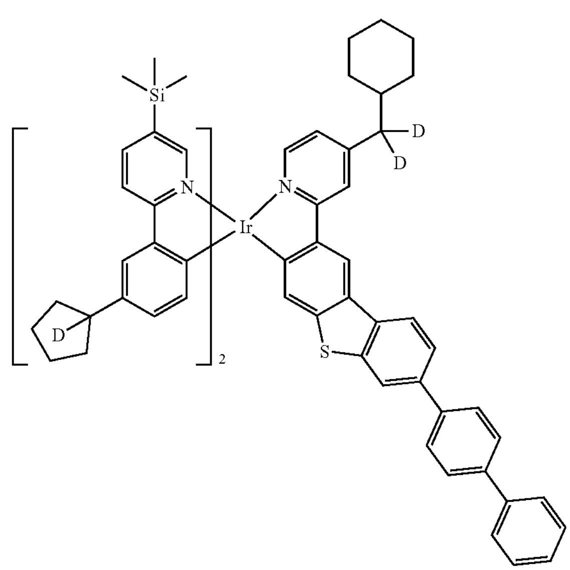

-continued
2690
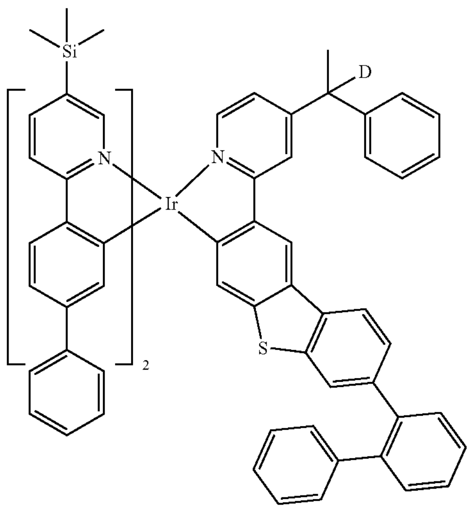
2691
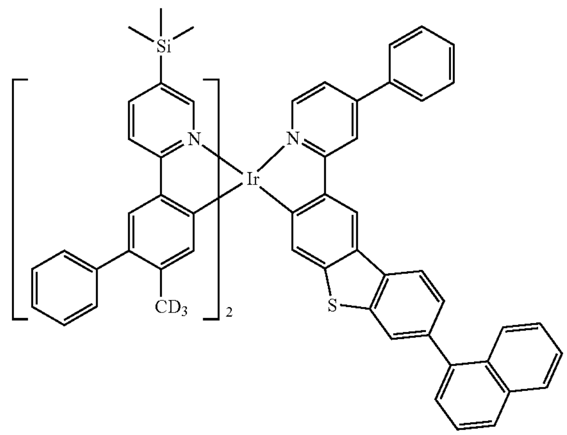
2692
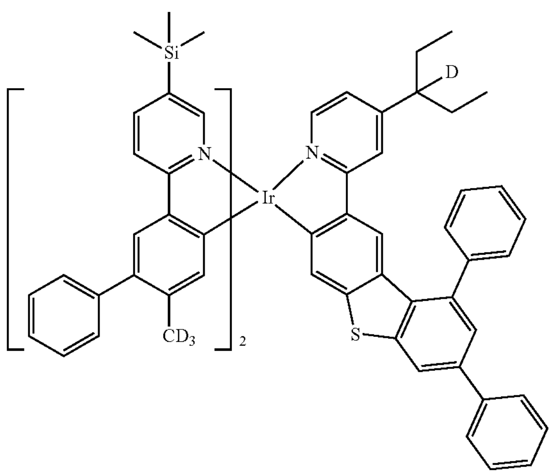
2693
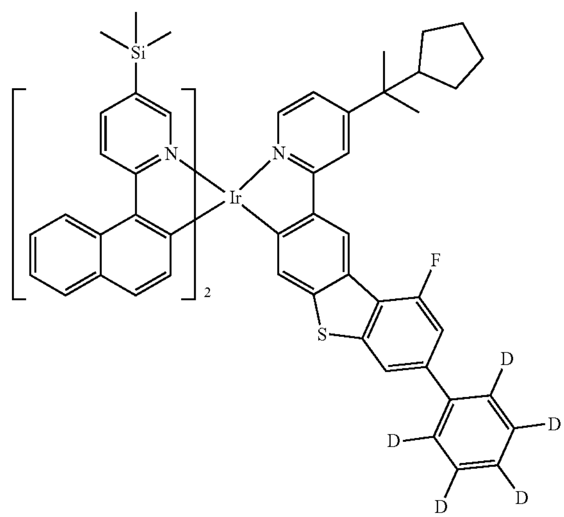
2694
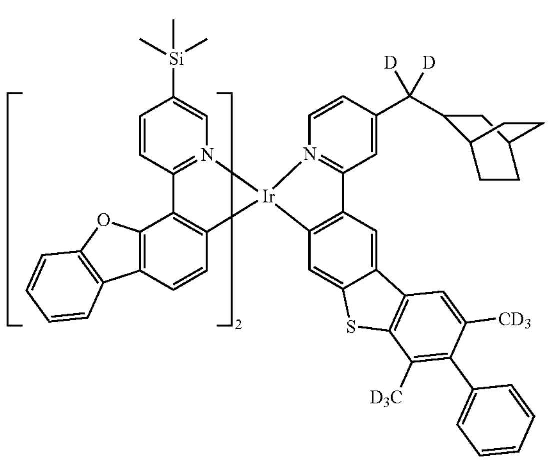
2695
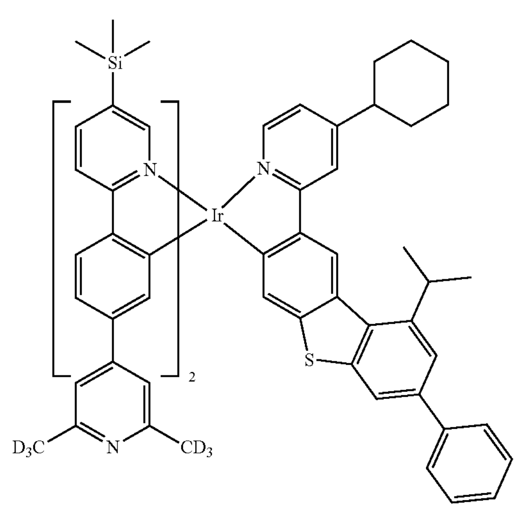

-continued
2696
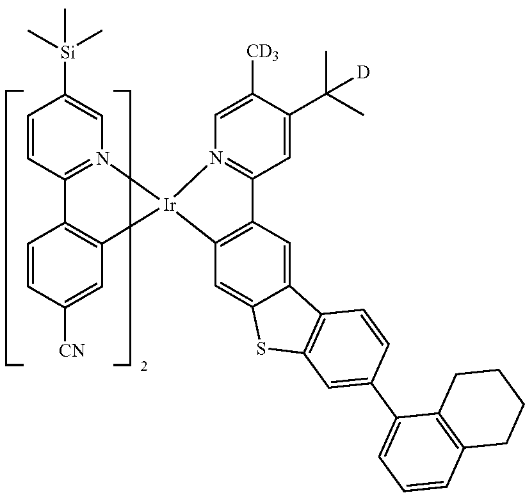
2697
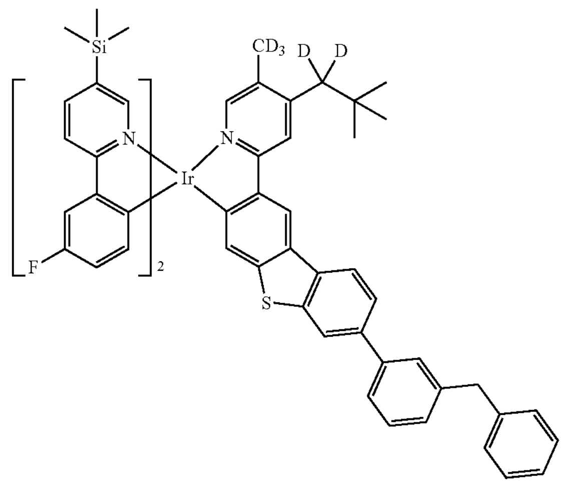
2698
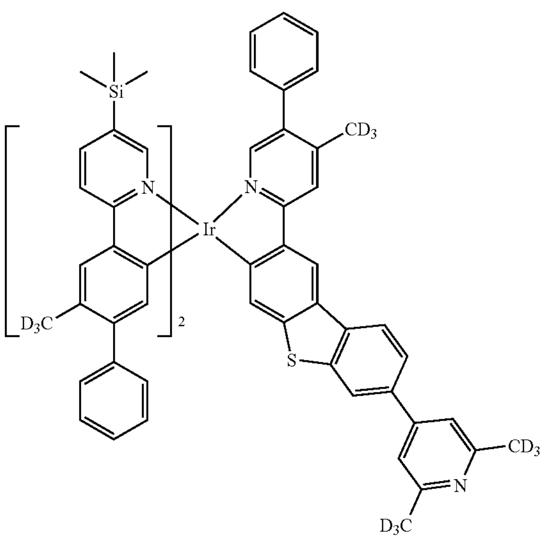
2699
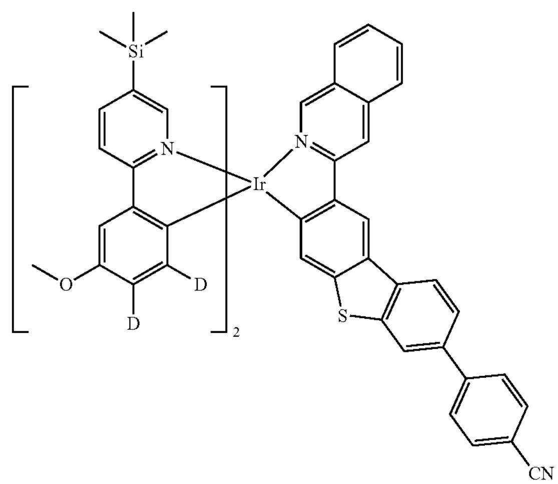
2700
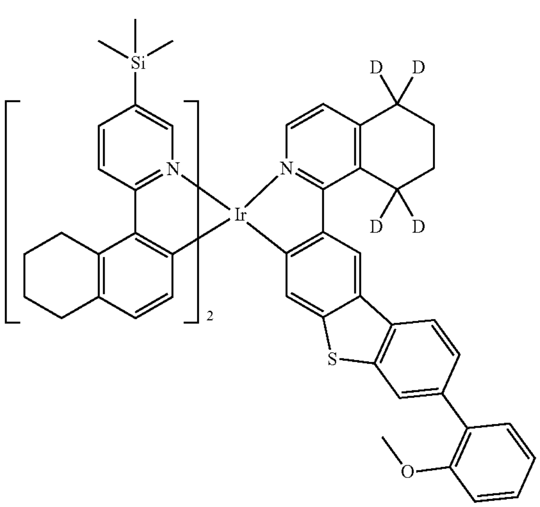
2701
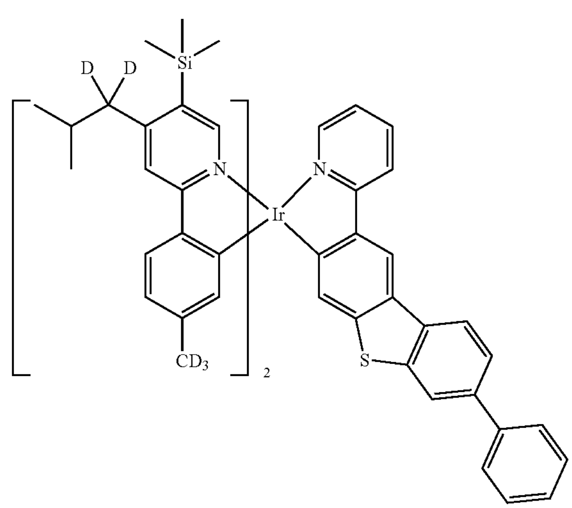

-continued
2702
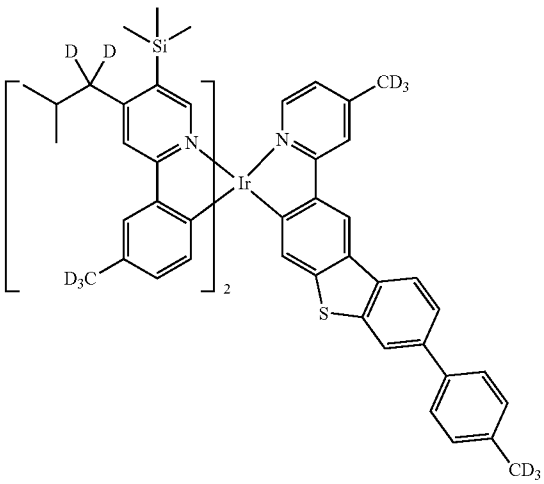
2703
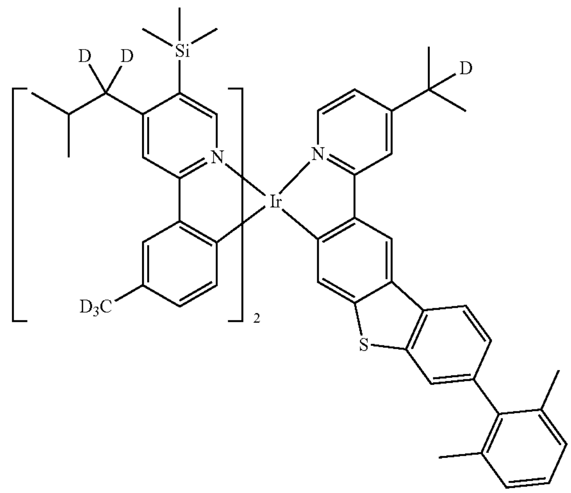
2704
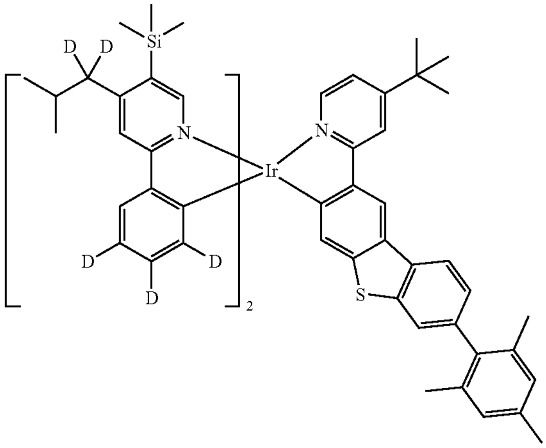
2705
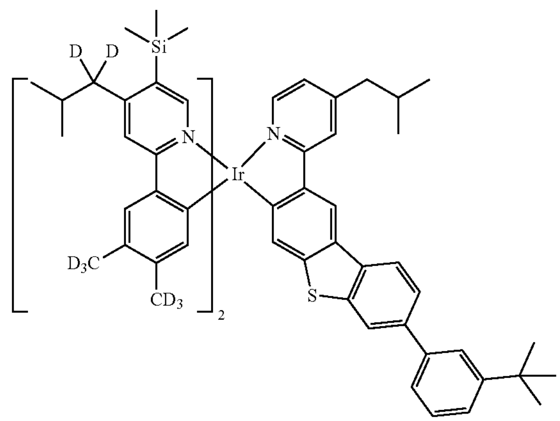
2706
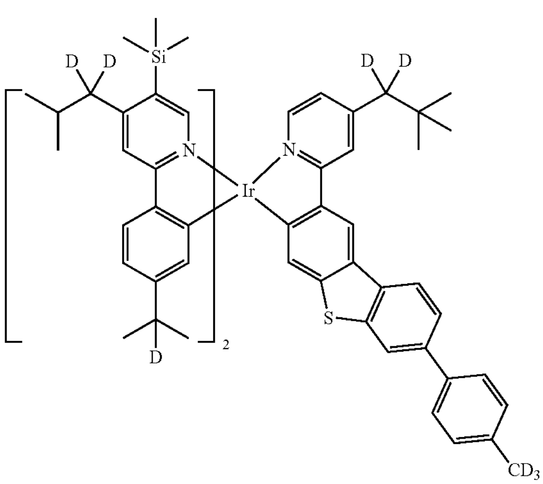
2707
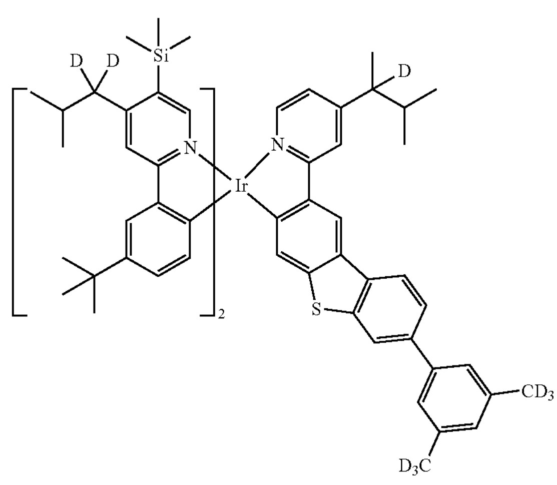

-continued
2708
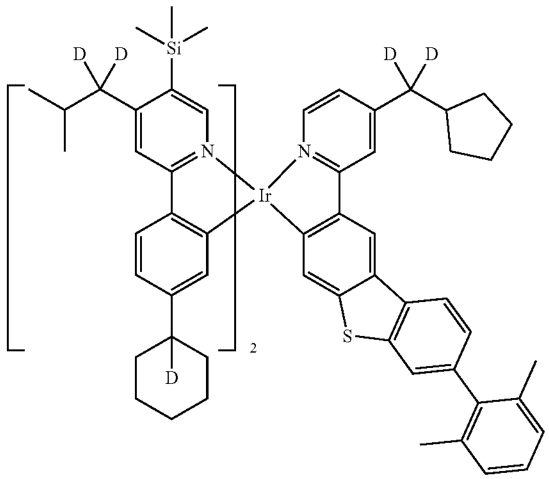
2709
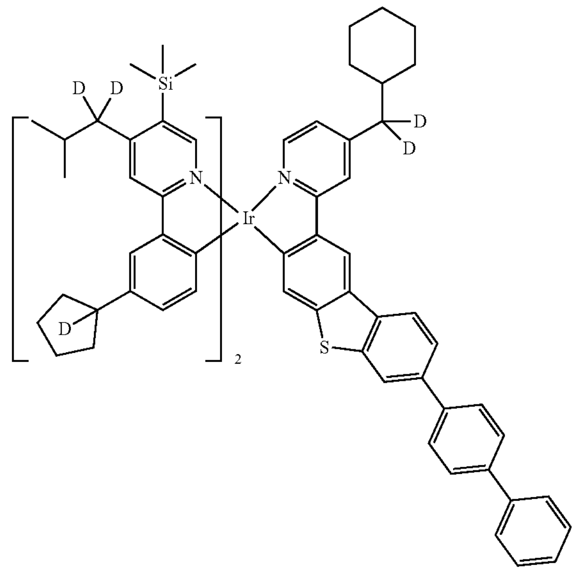
2710
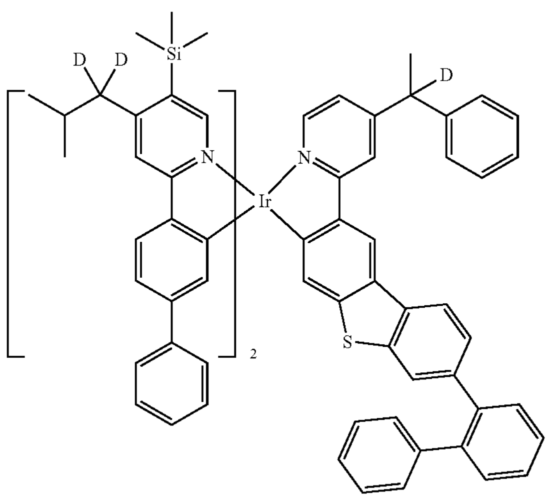
2711
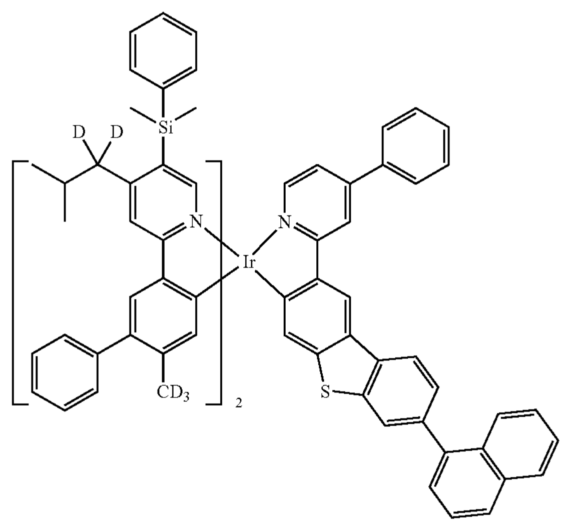
2712
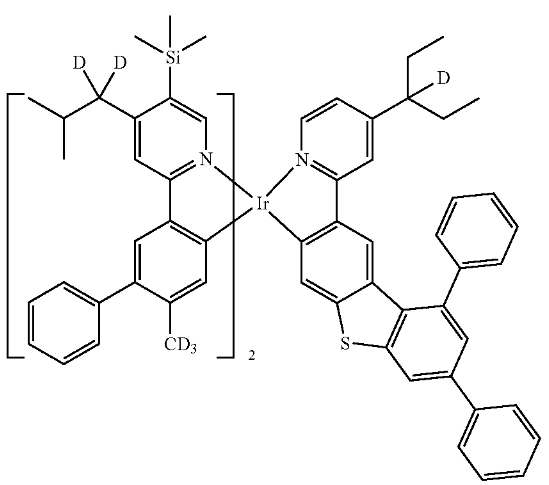
2713
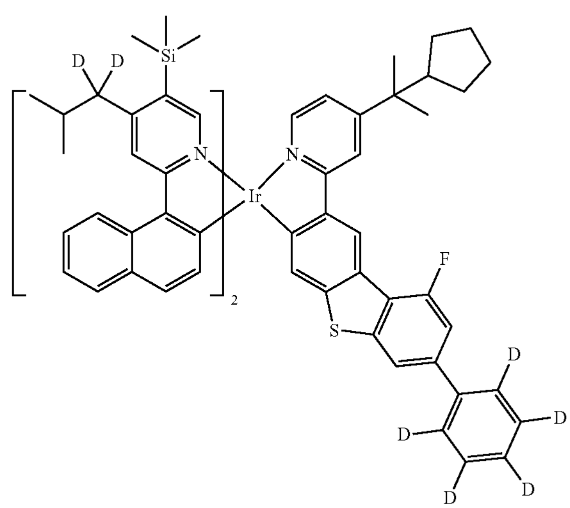

-continued
2714
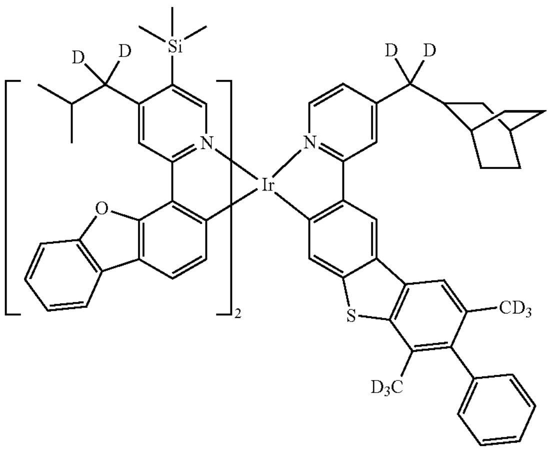
2715
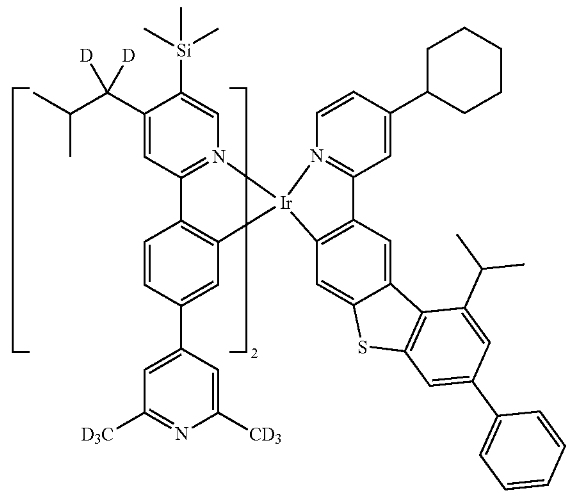
2716
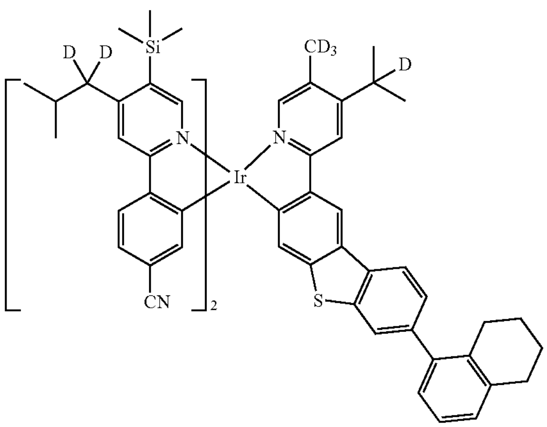
2717
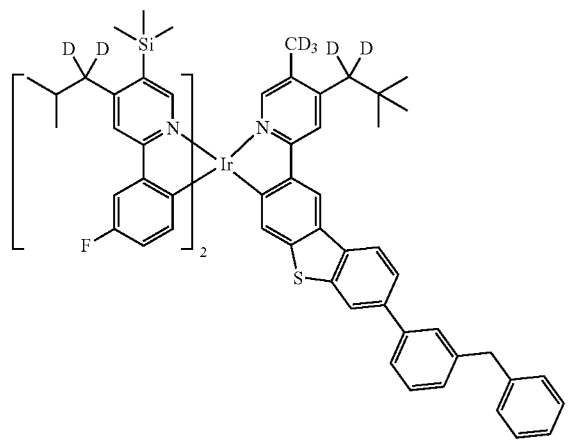
2718
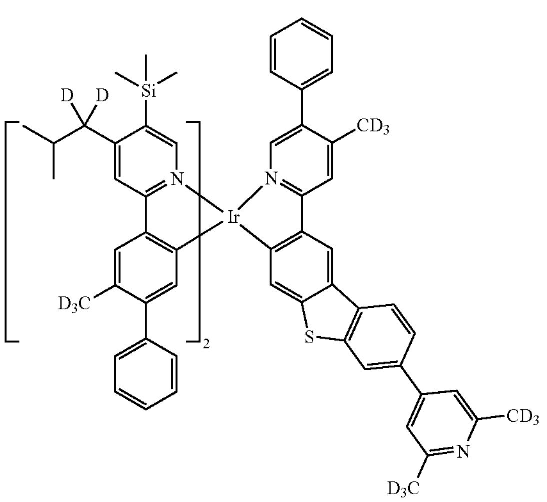
2719
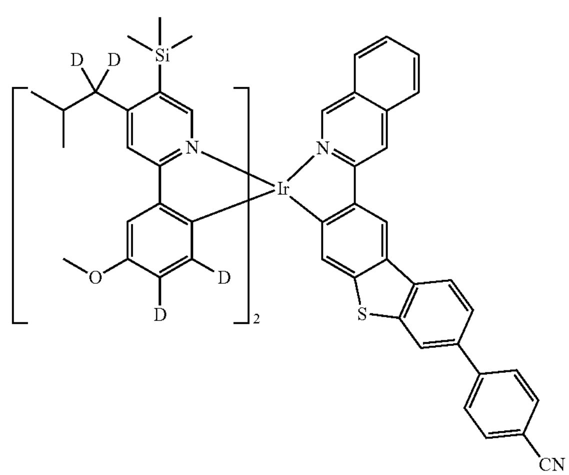

-continued
2720
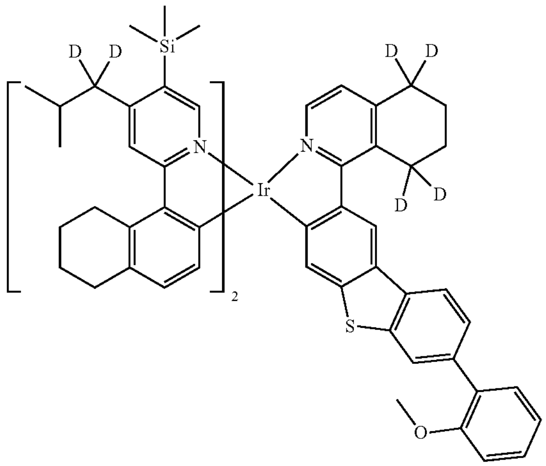
2721
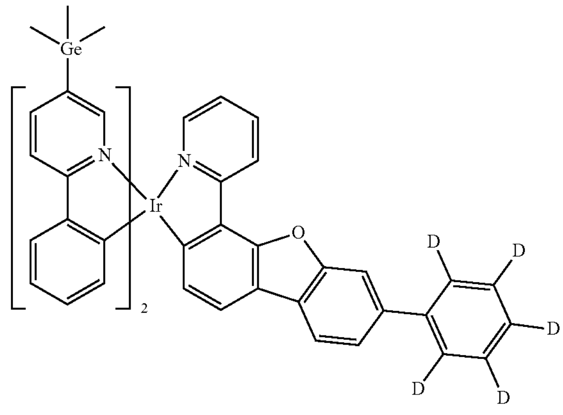
2722
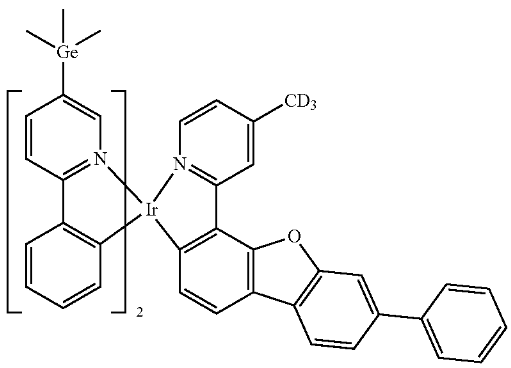
2723
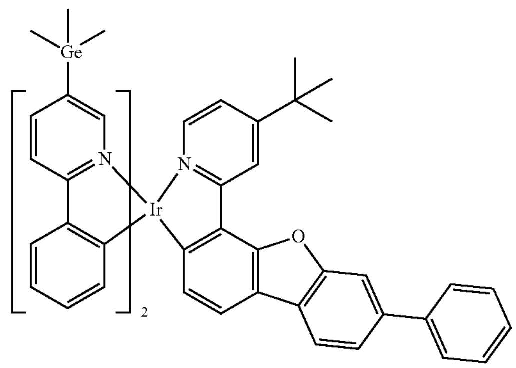
2724
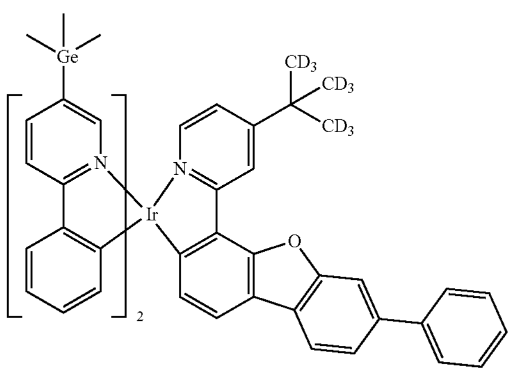
2725
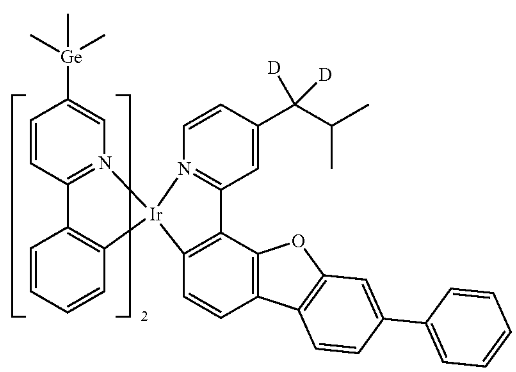
2726
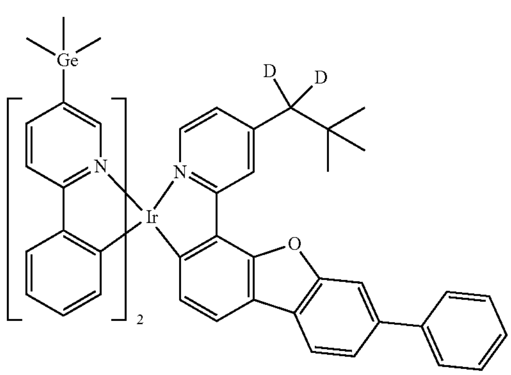
2727
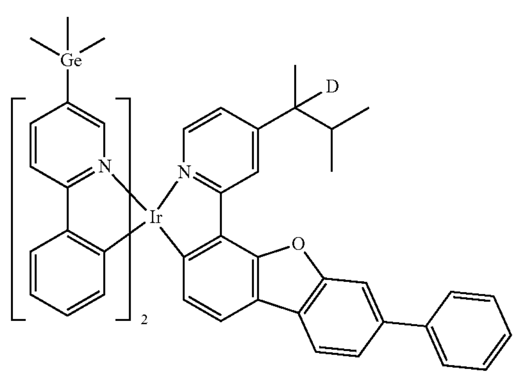

-continued
2728
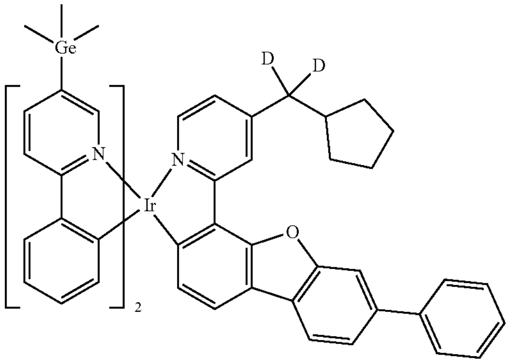
2729
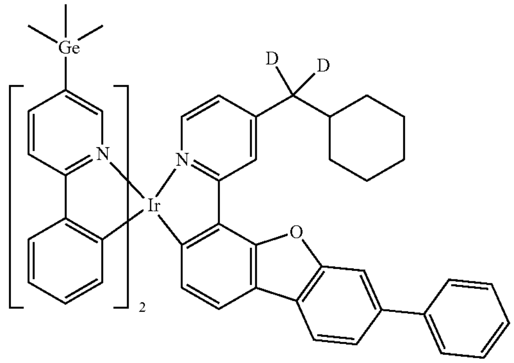
2730
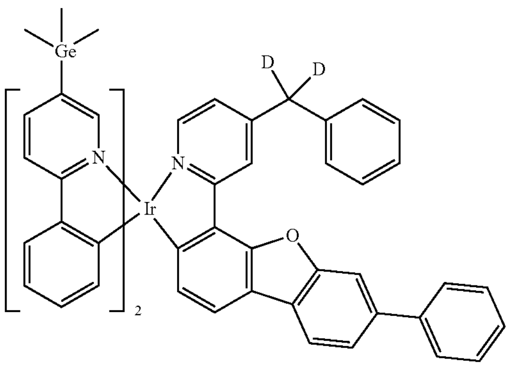
2731
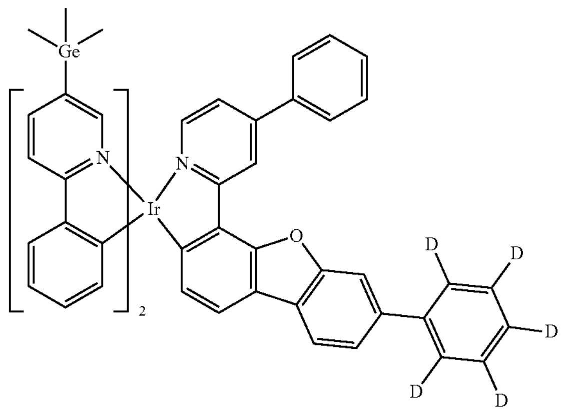
2732
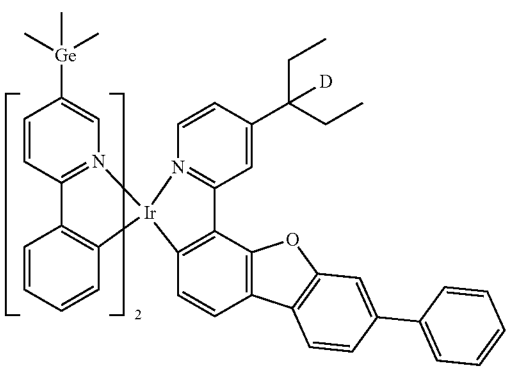
2733
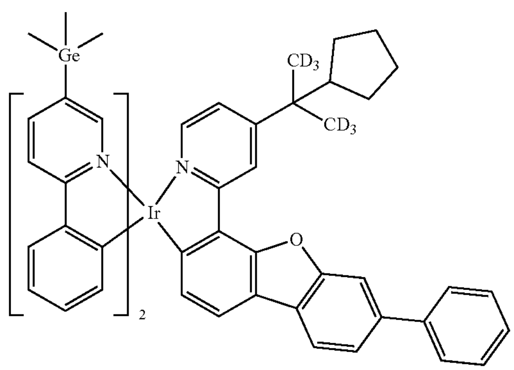
2734
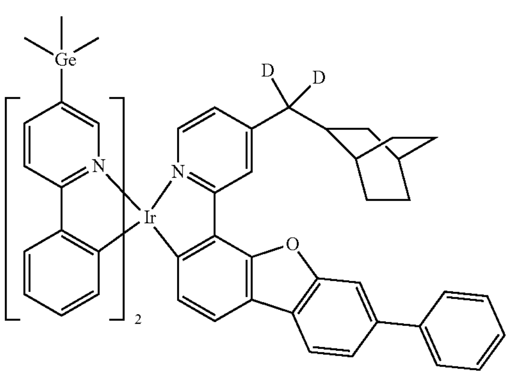
2735
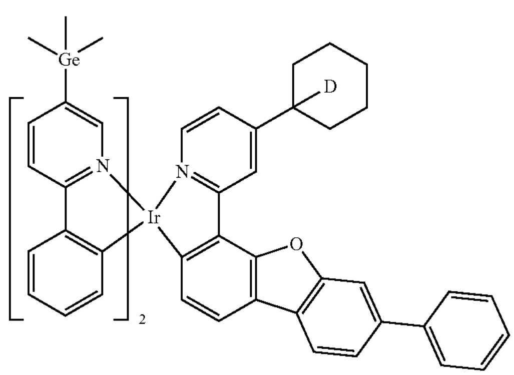

-continued
2736
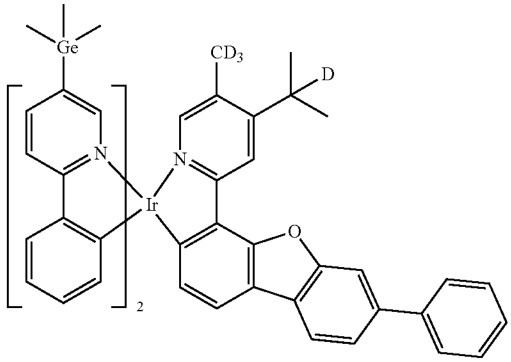
2737
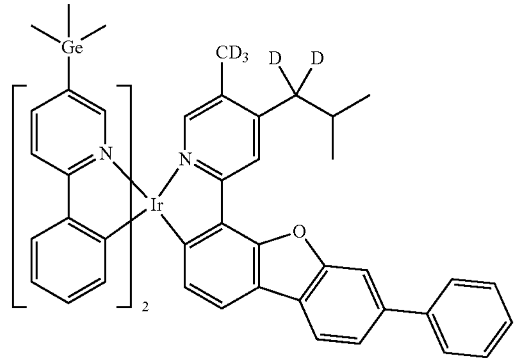
2738
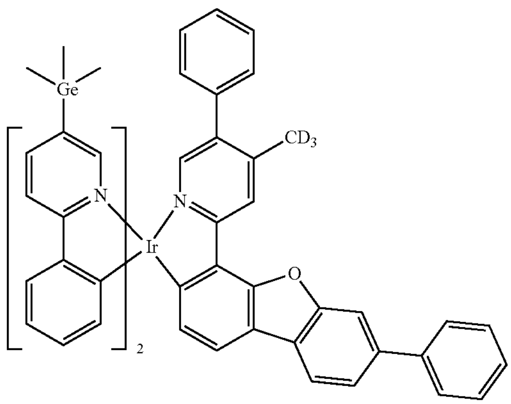
2739
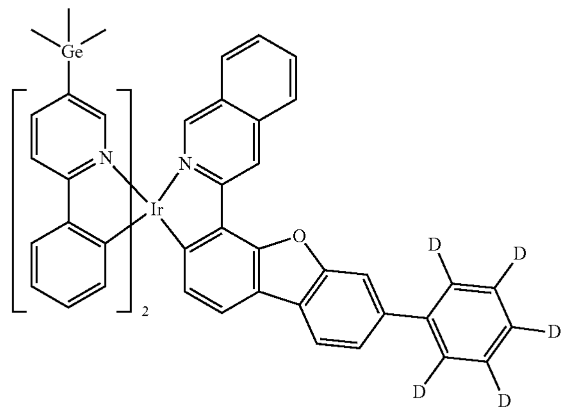
2740
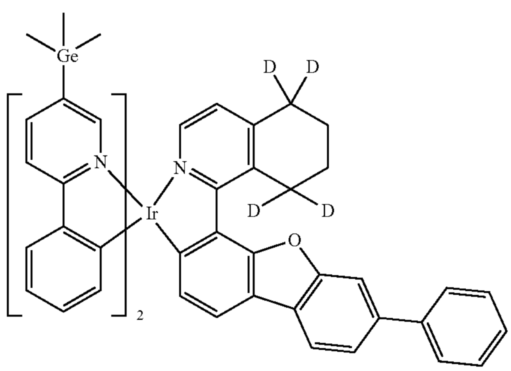
2741
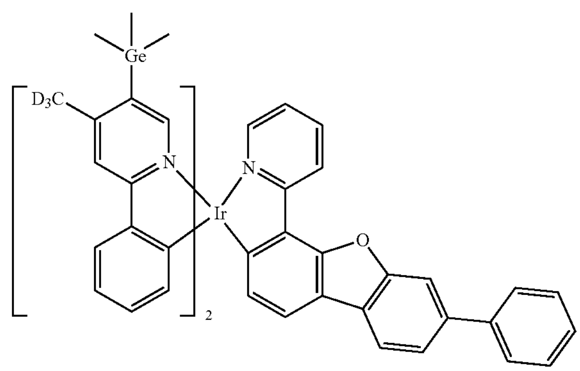
2742
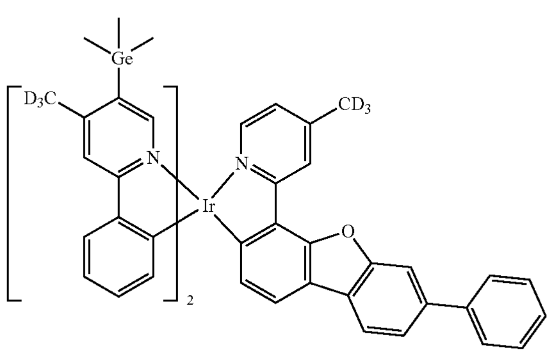
2743
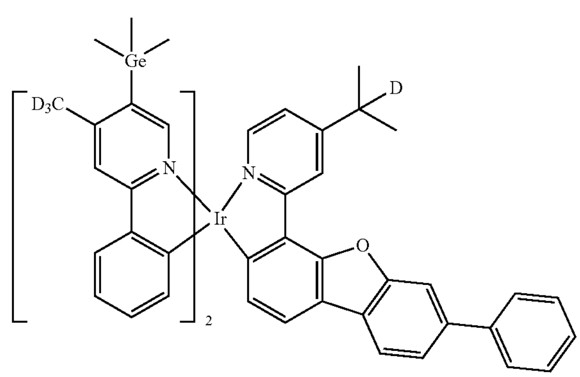

-continued
2744
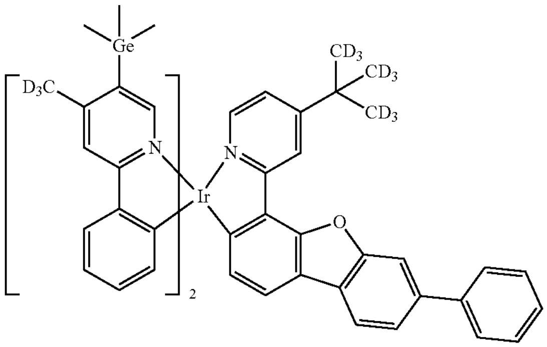
2745
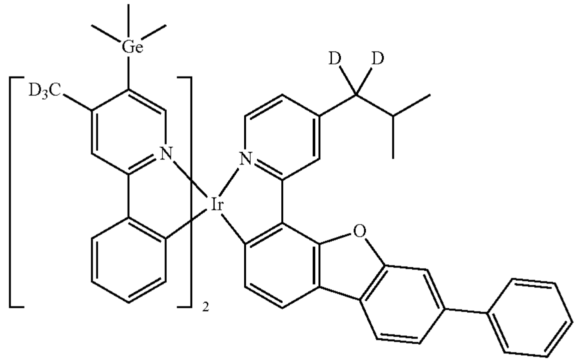
2746
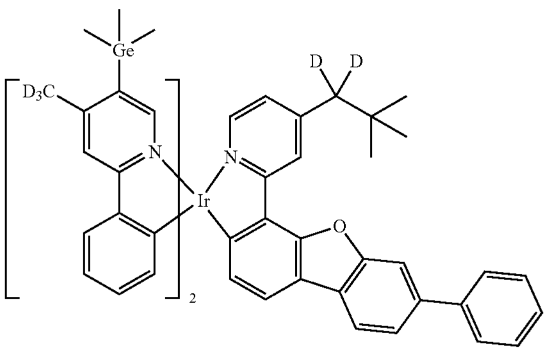
2747
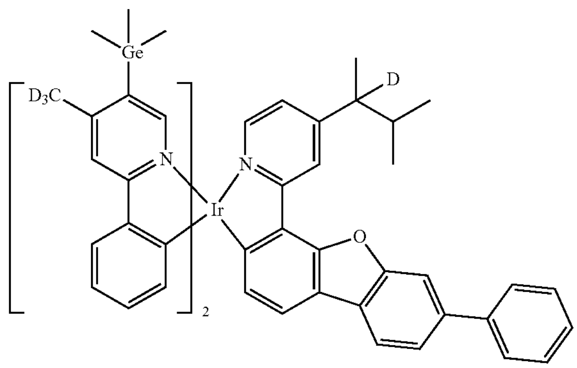
2748
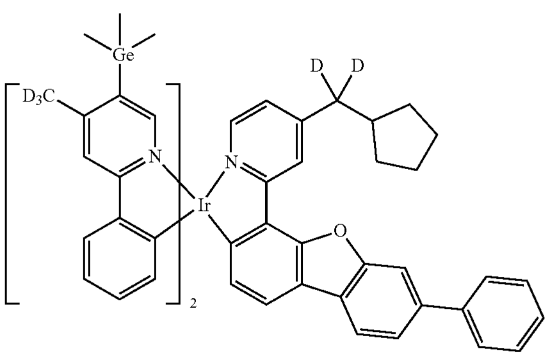
2749
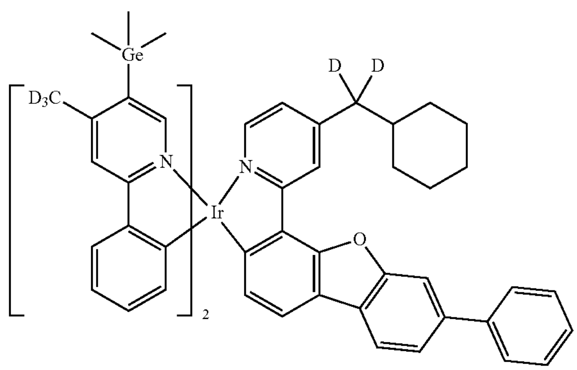
2750
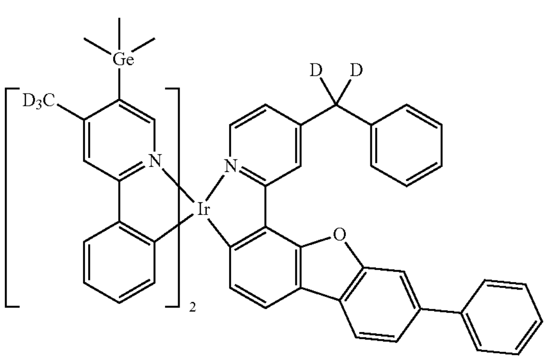
2751
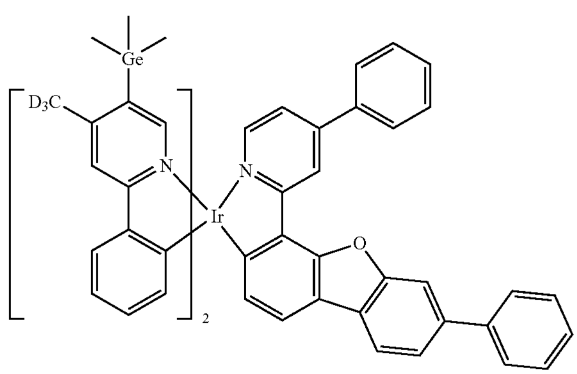

-continued
2752
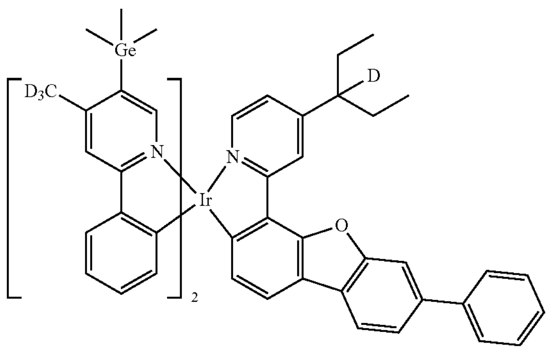
2753
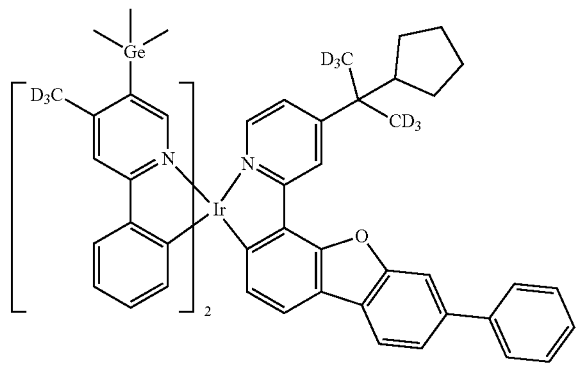
2754
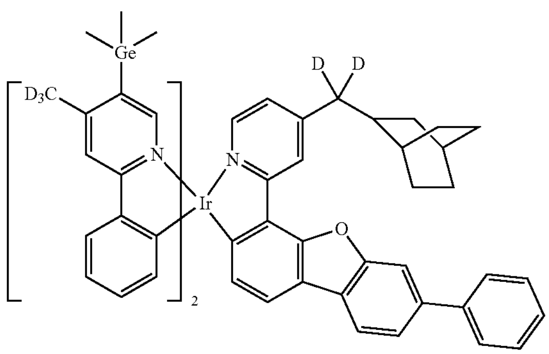
2755
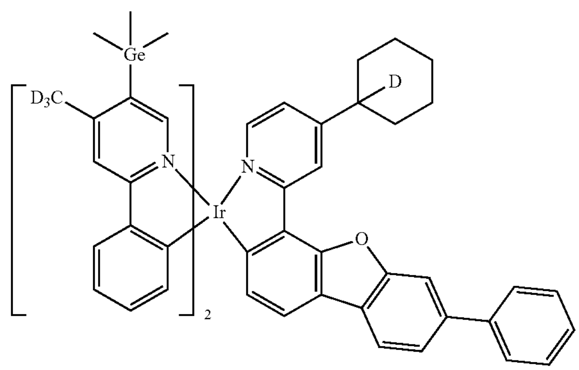
2756
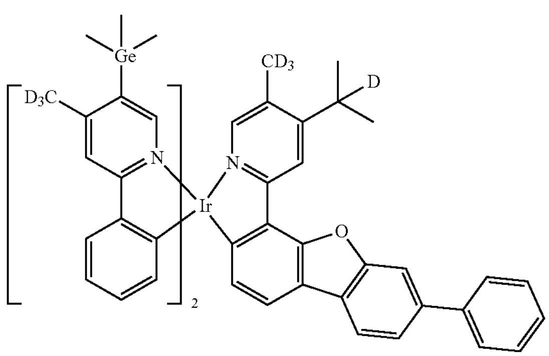
2757
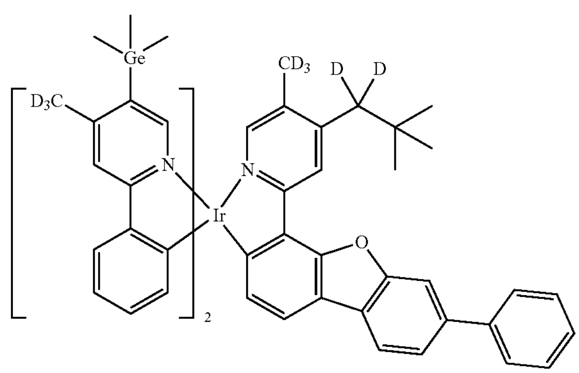
2758
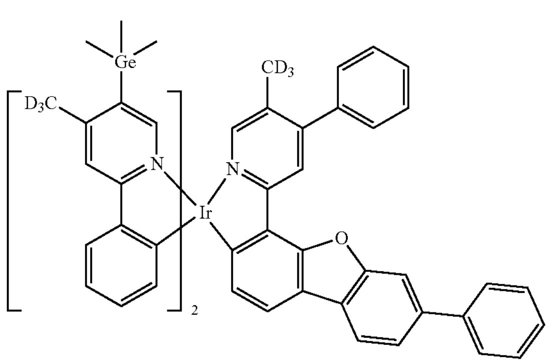
2759
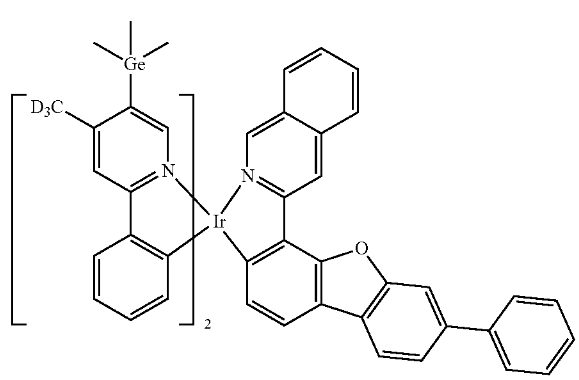

-continued
2760
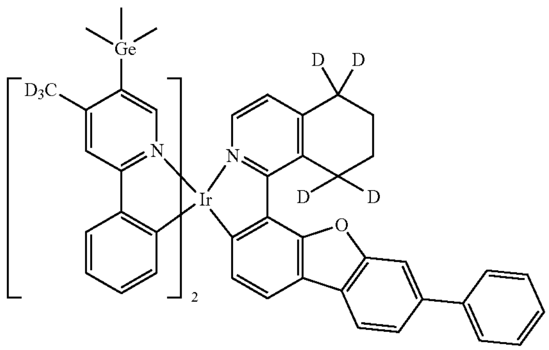
2761
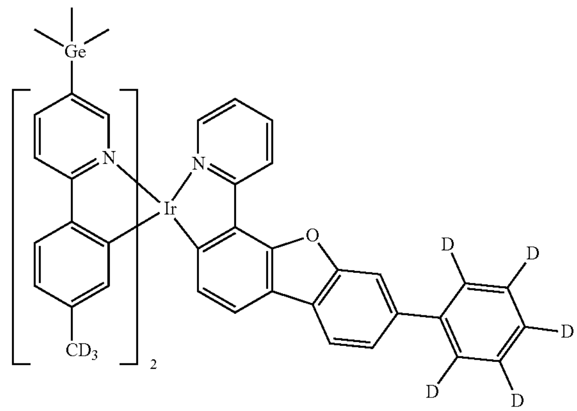
2762
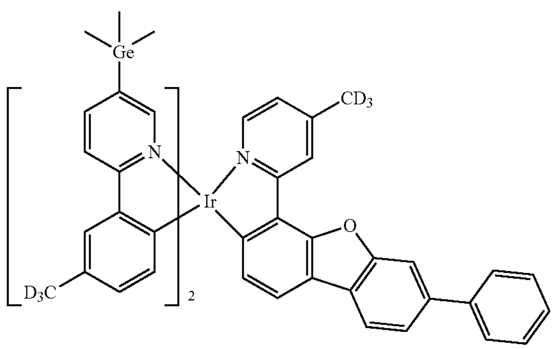
2763
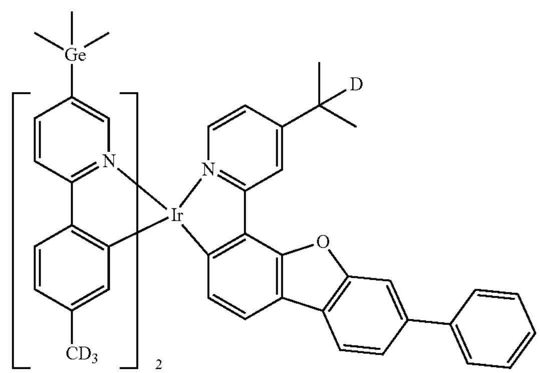
2764
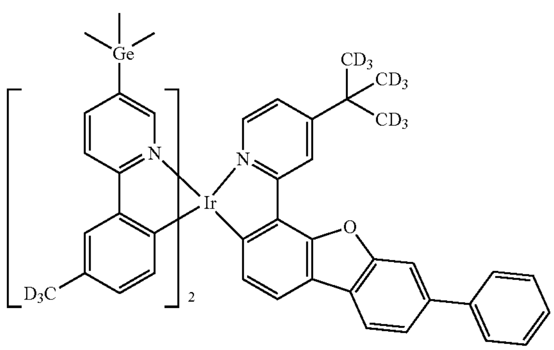
2765
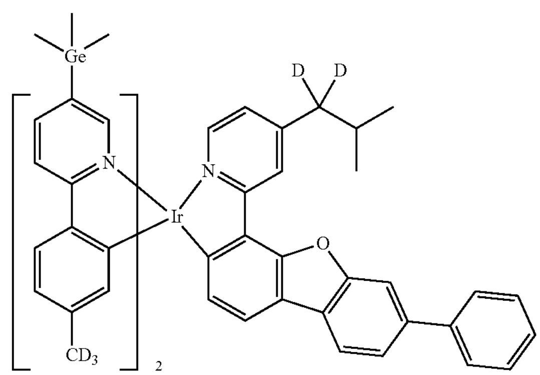
2766
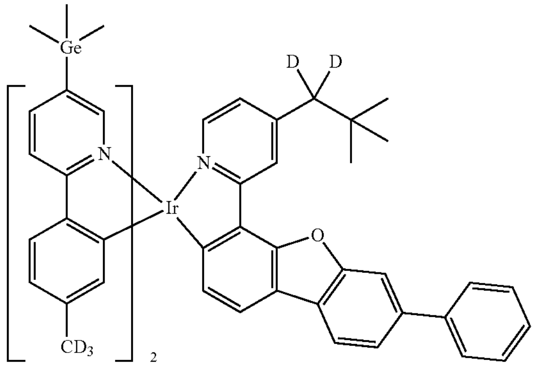
2767
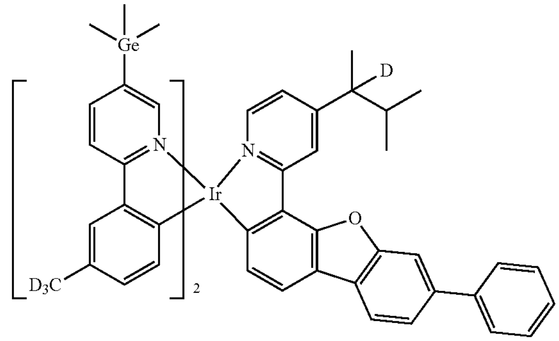

-continued
2768
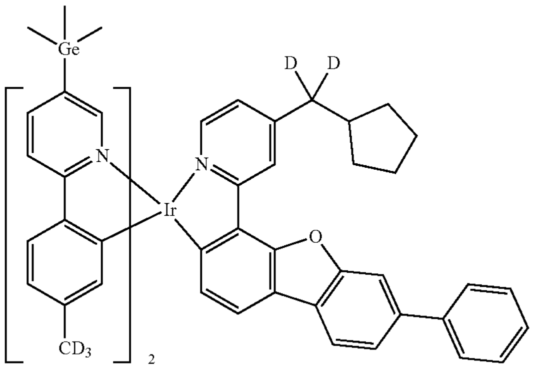
2769
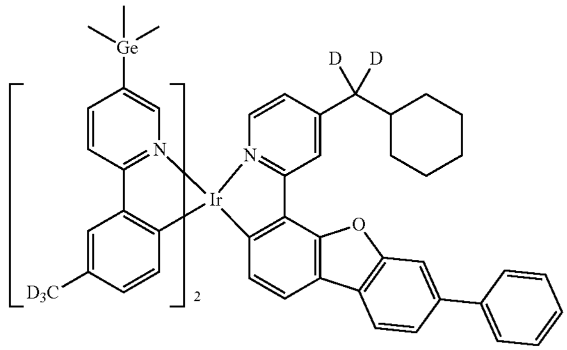
2770
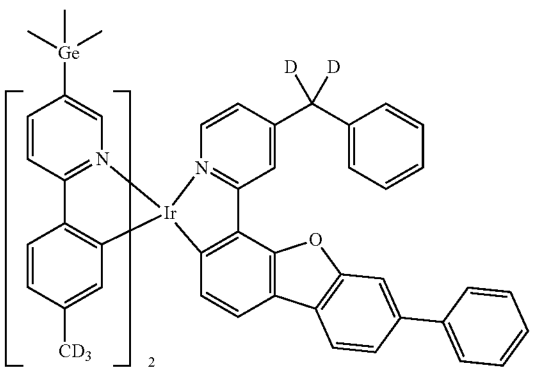
2771
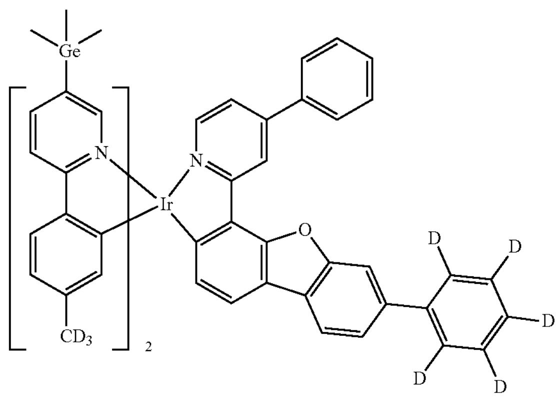
2772
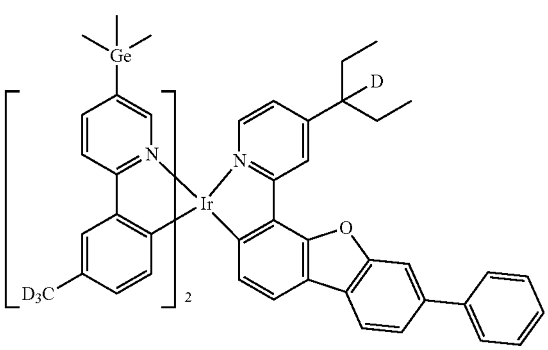
2773
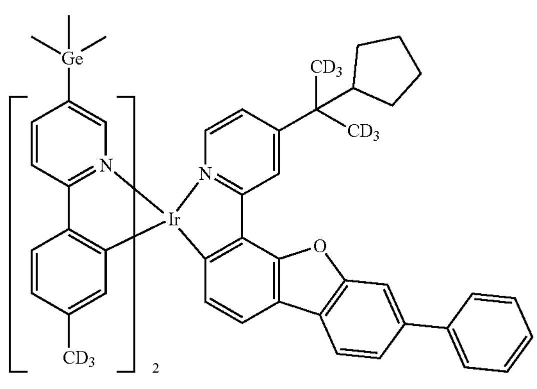
2774
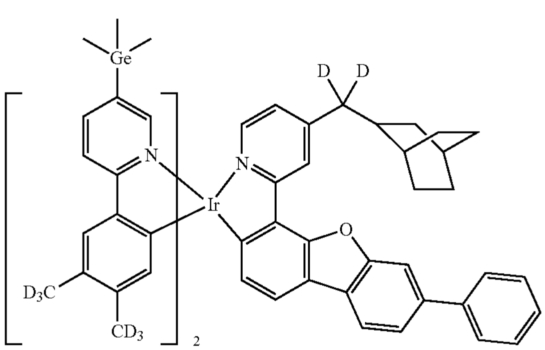
2775
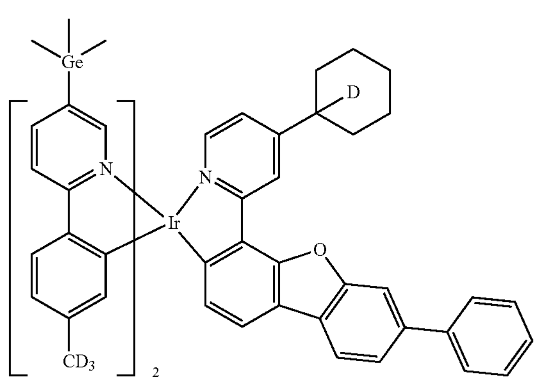

-continued
2776
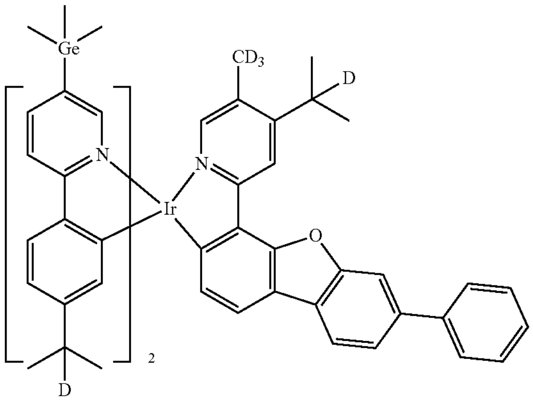
2777
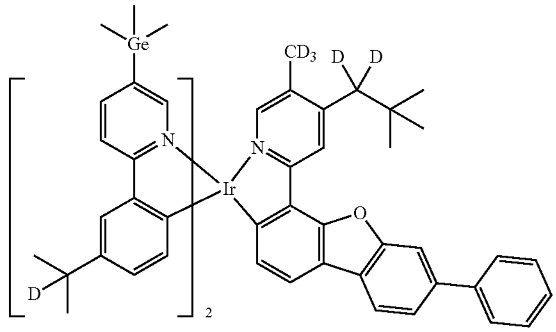
2778
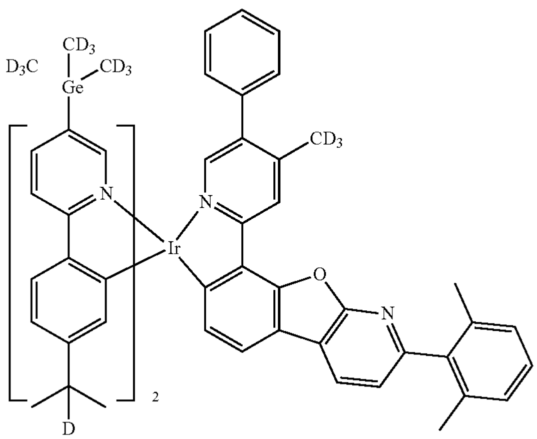
2779
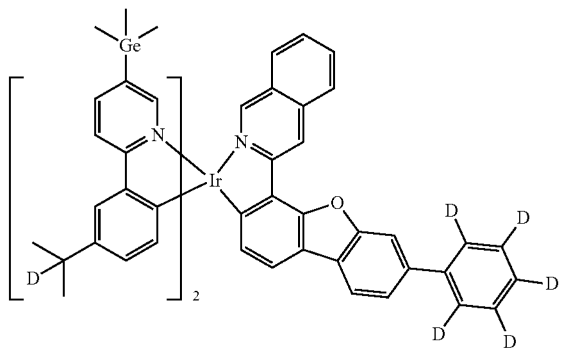
2780
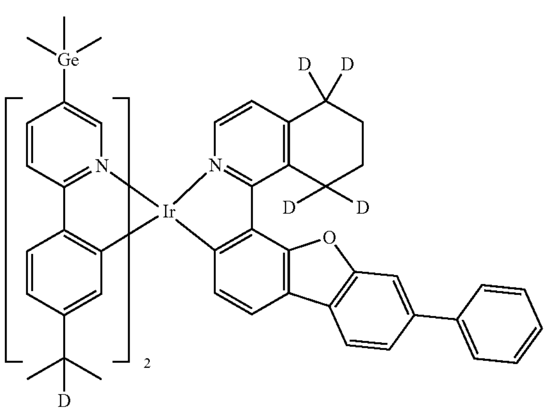
2781
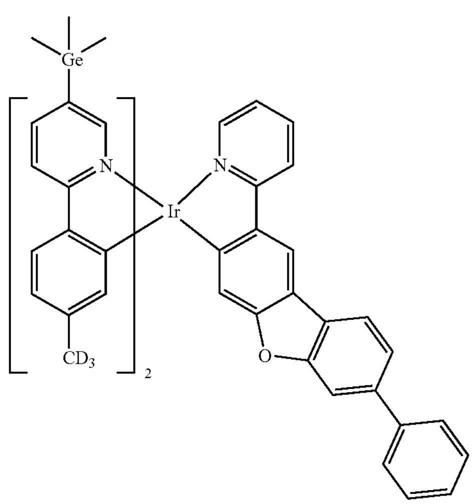

-continued
2782
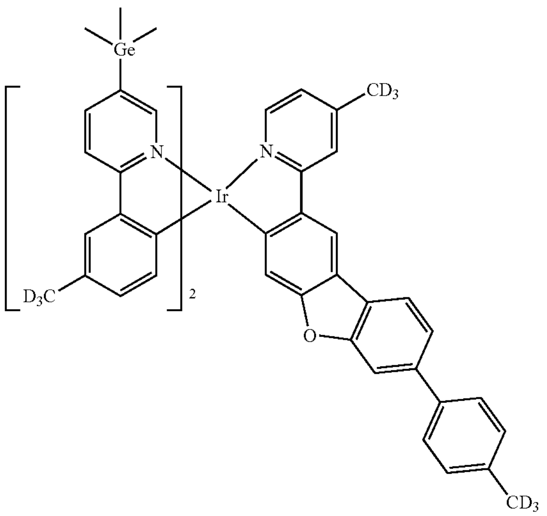
2783
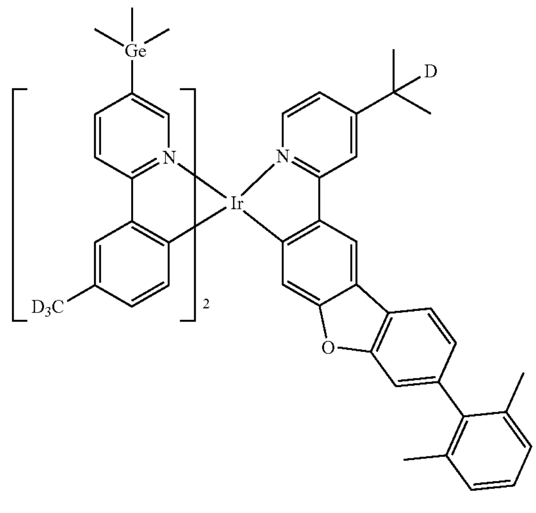
2784
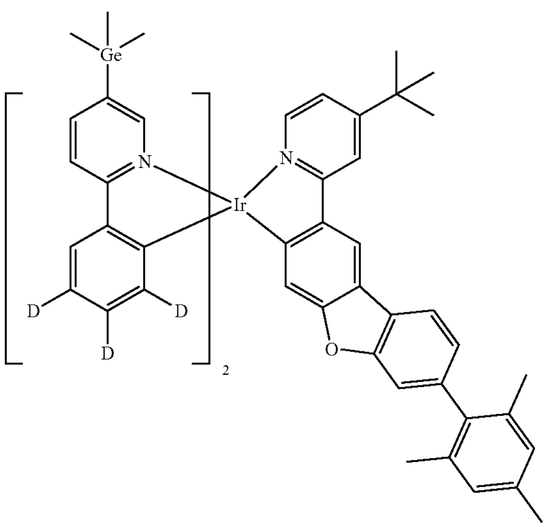
2785
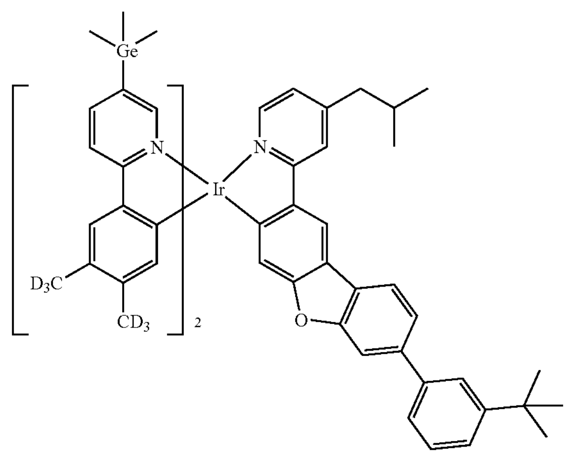
2786
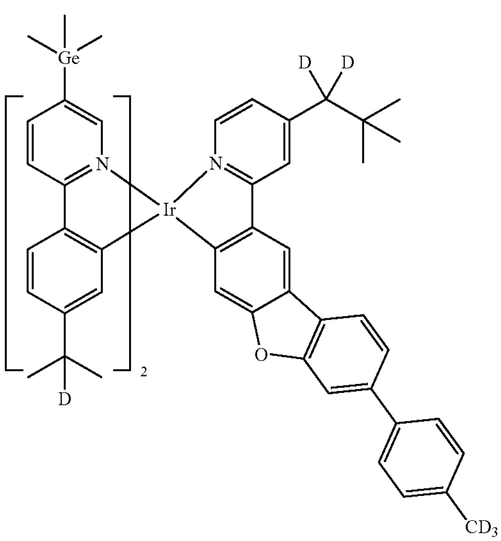
2787
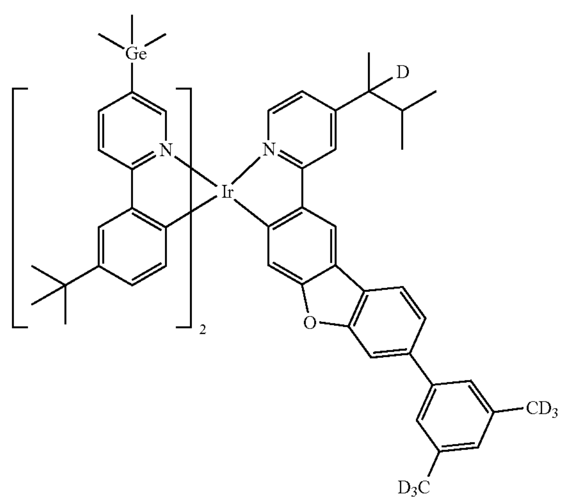

-continued
2788
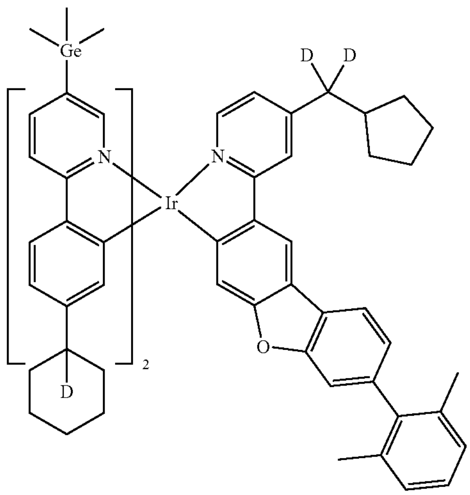
2789
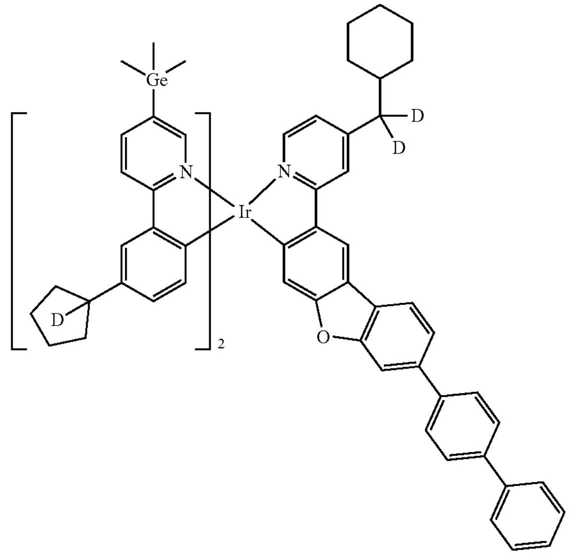
2790
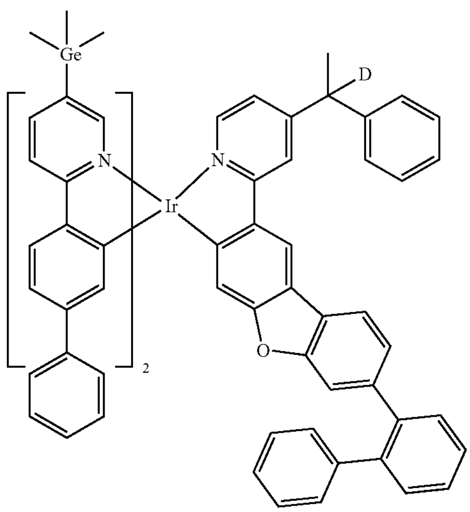
2791
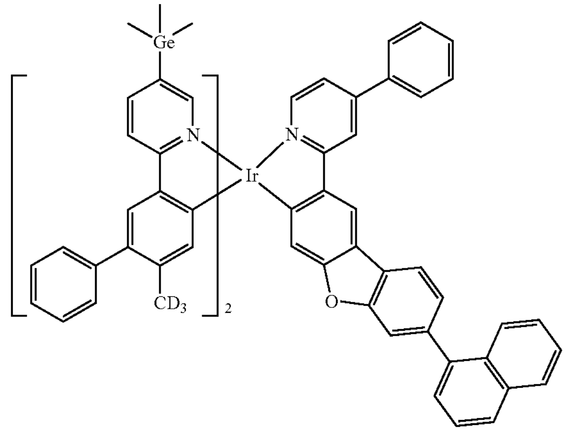
2792
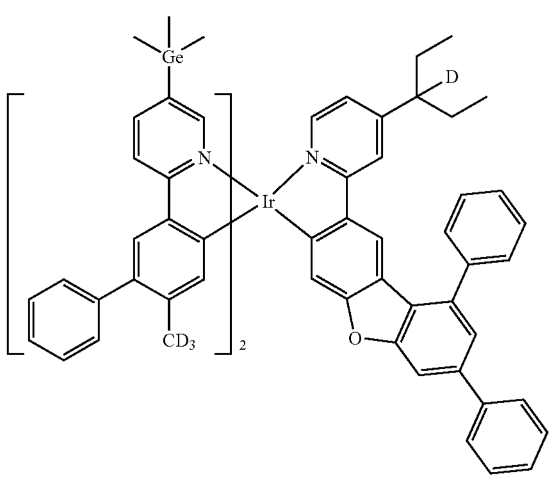
2793
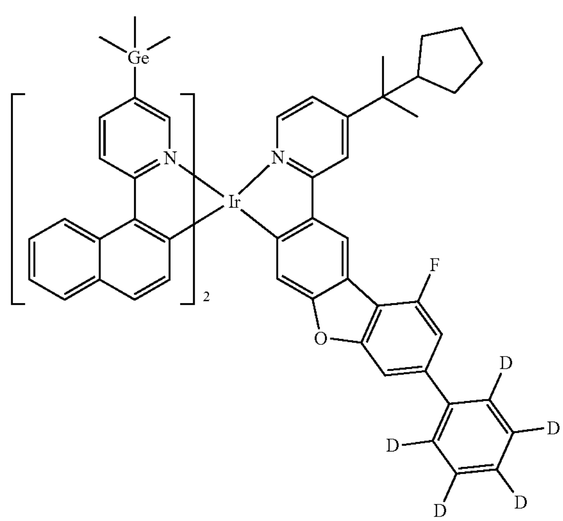

-continued
2794
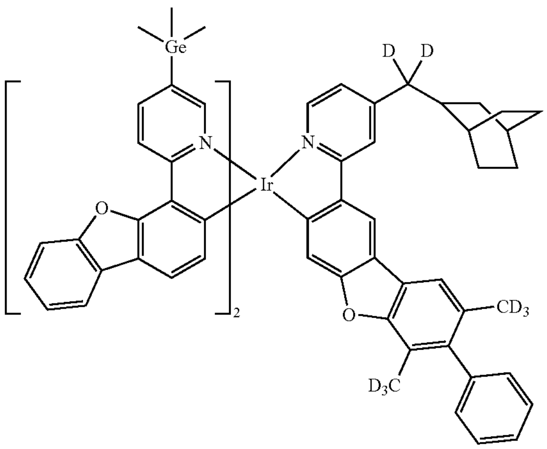
2795
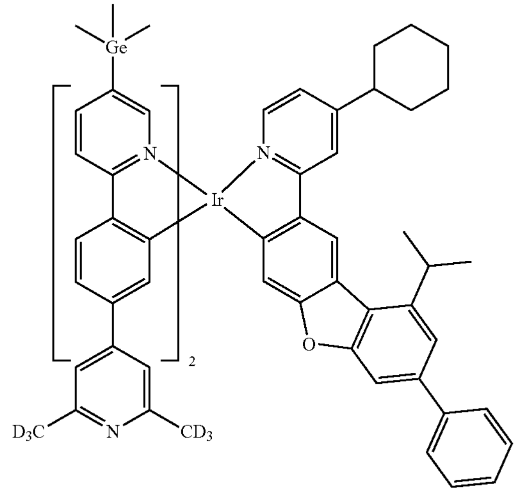
2796
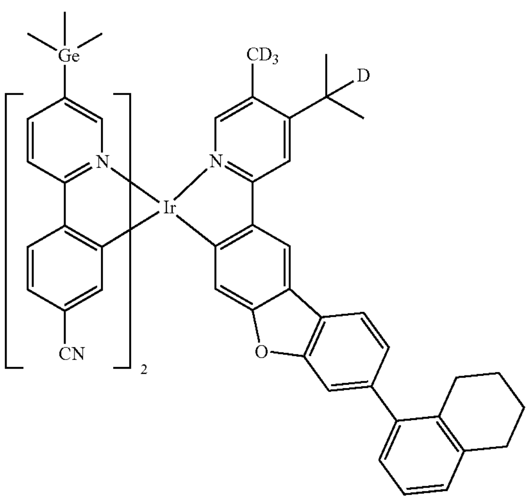
2797
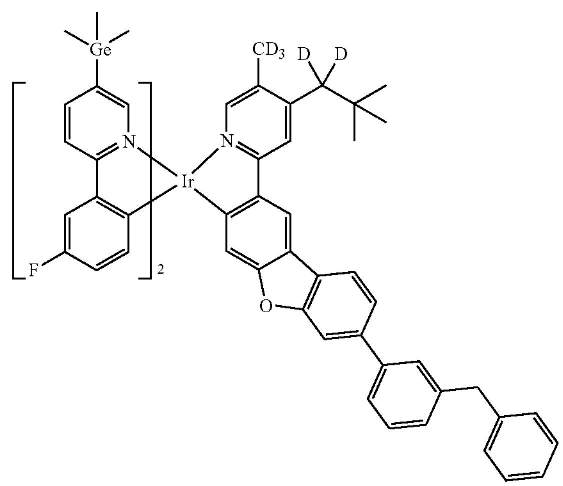
2798
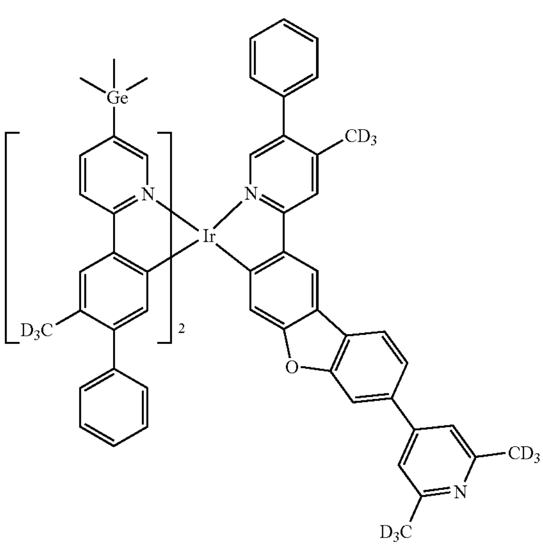
2799
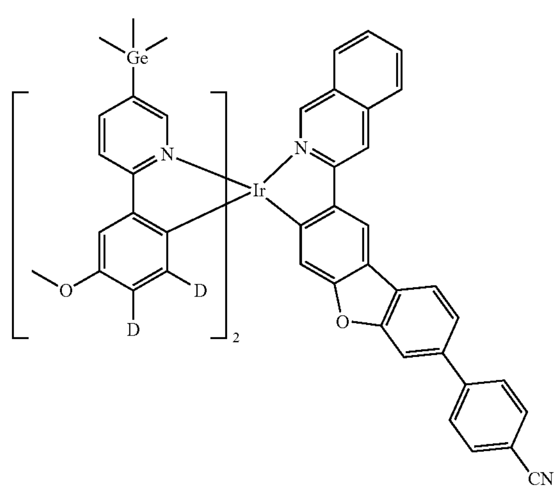

-continued
2800
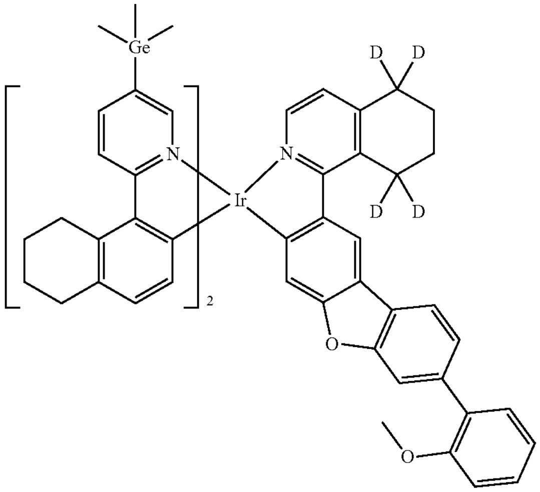
2801
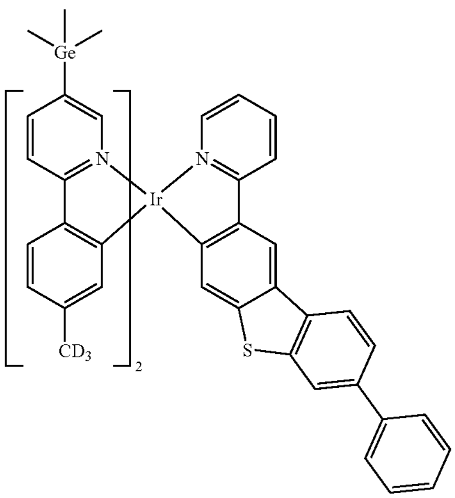
2802
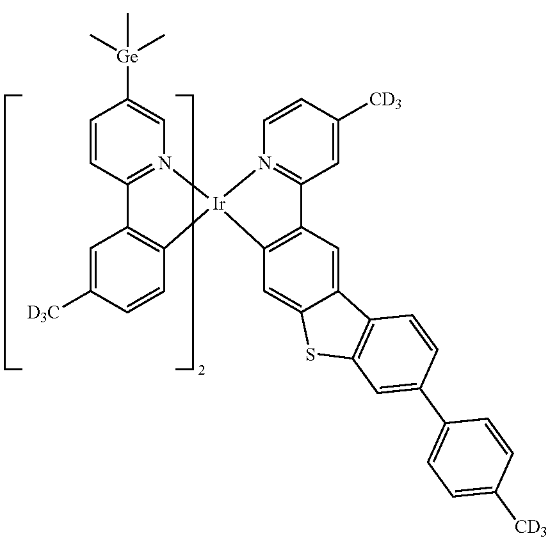
-continued
2803
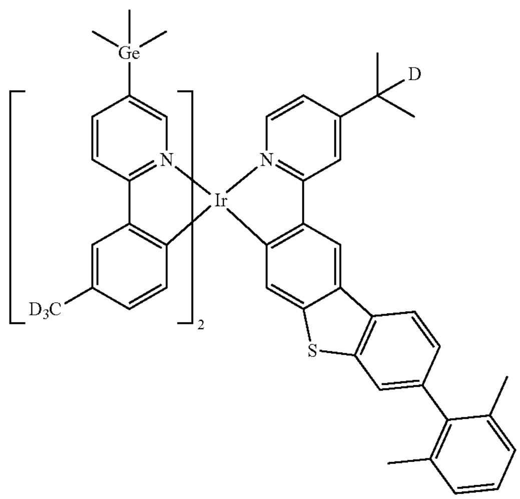
2804
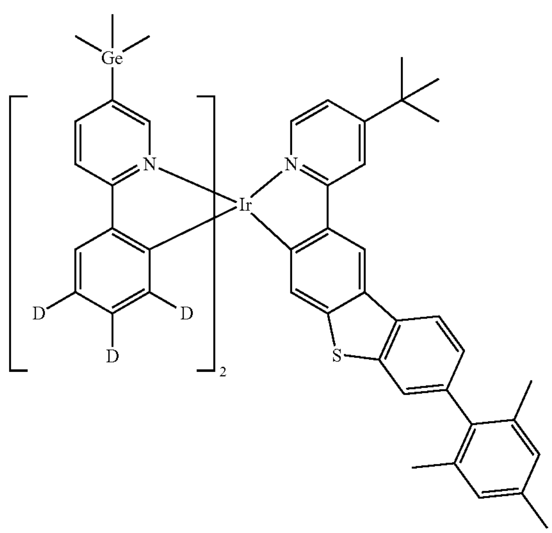

-continued
2805
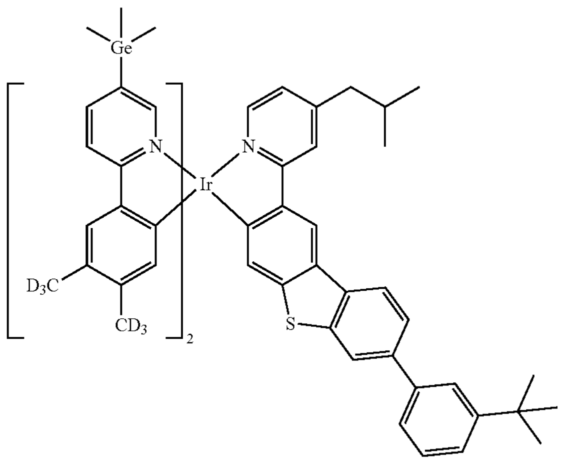
2806
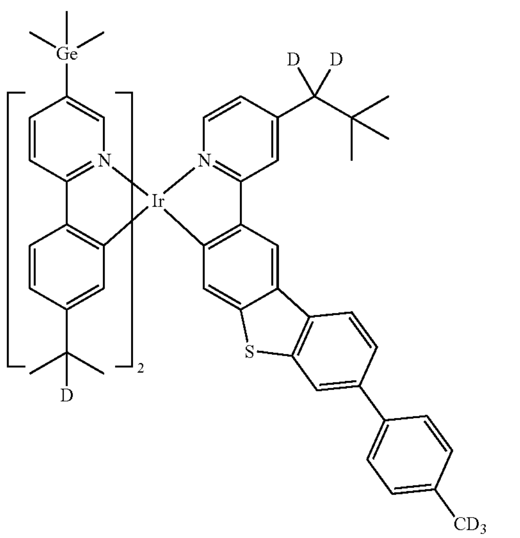
2807
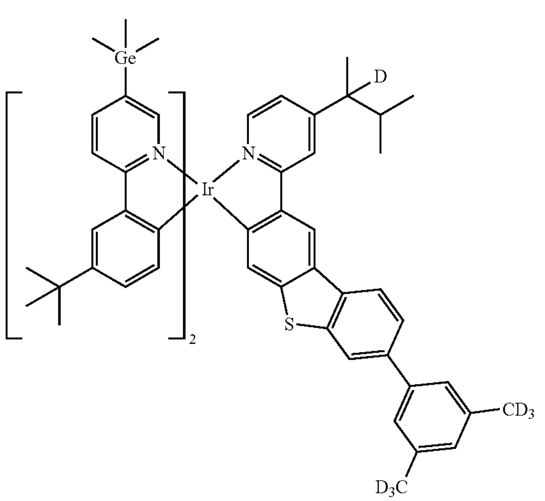
-continued
2808
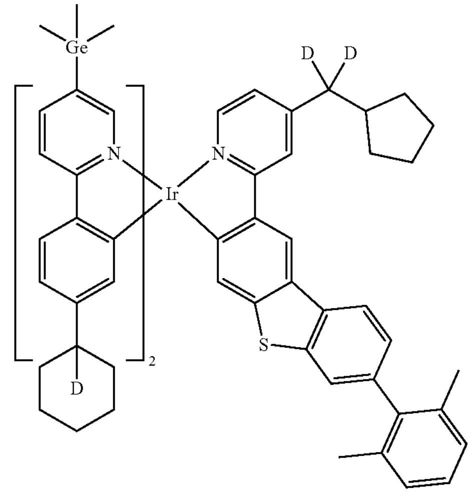
2809
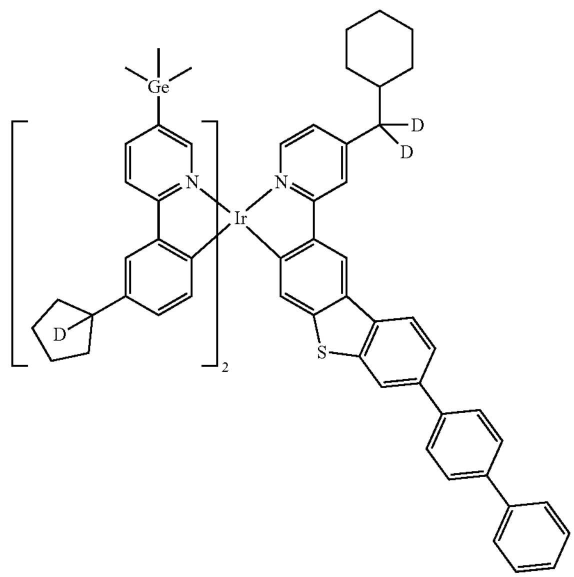
2810
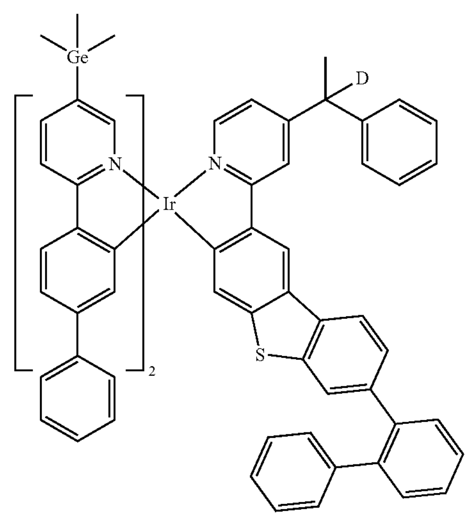

2811
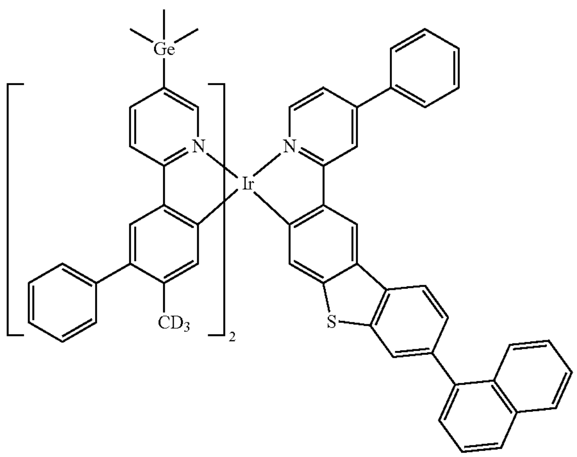
2812
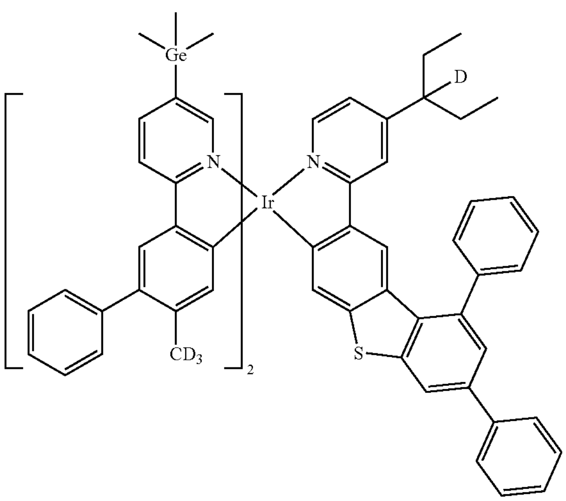
2813
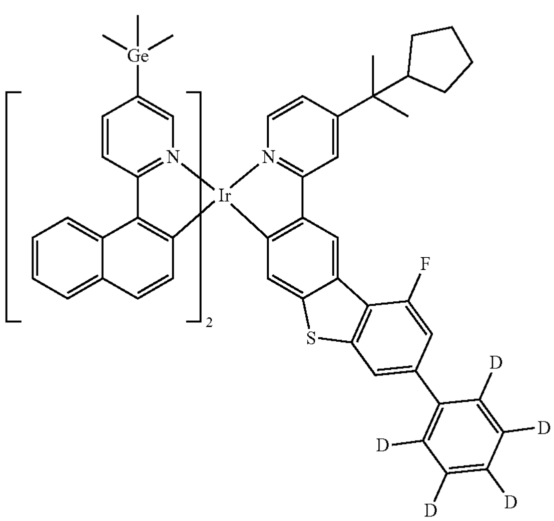
2814
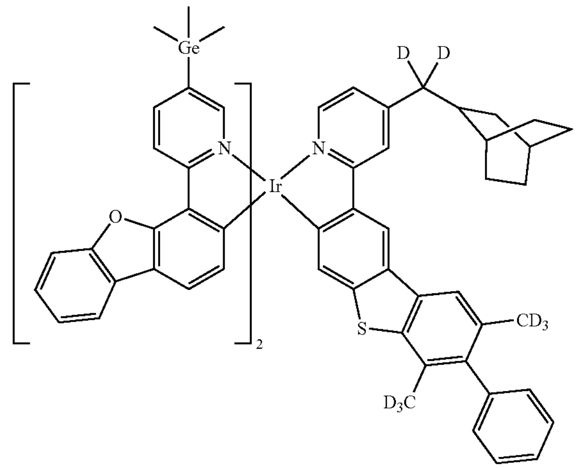
2815
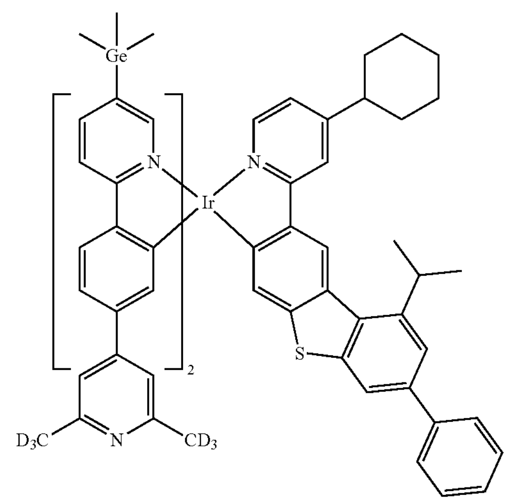
2816
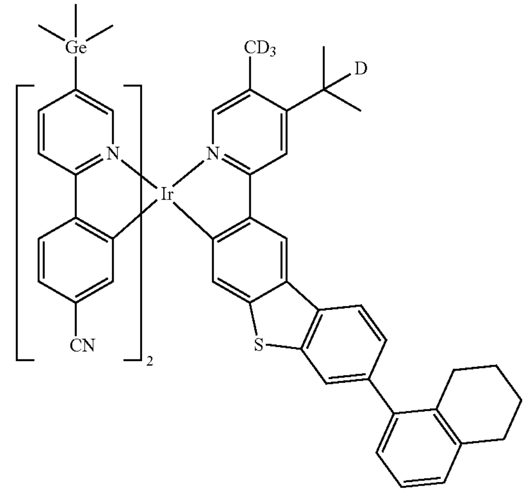

2817
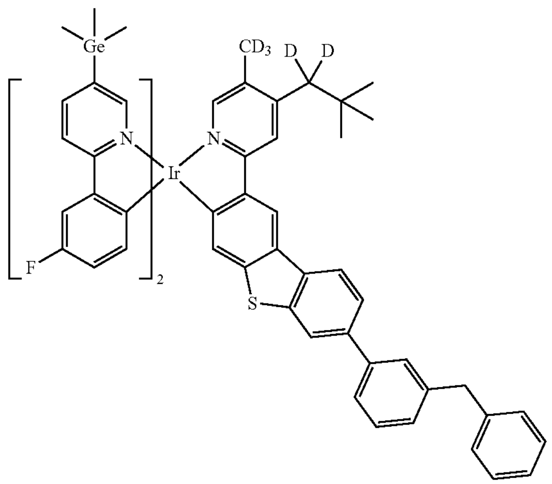
2818
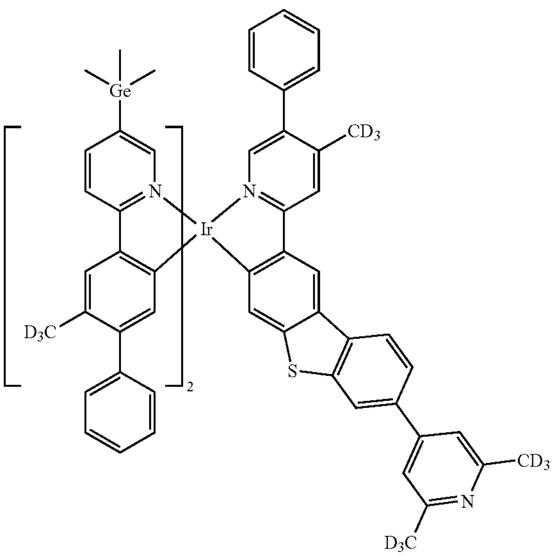
2819
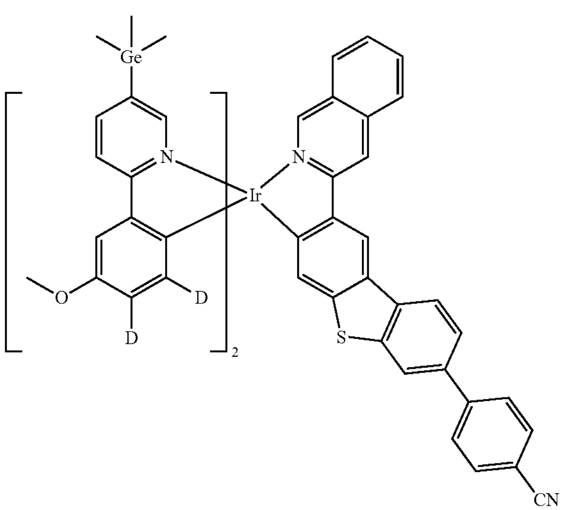
2820
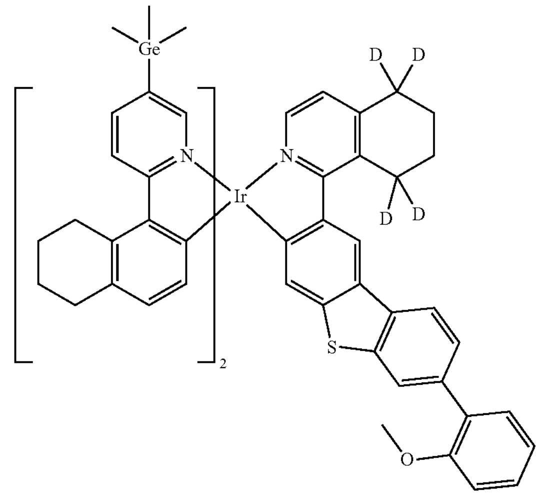
2821
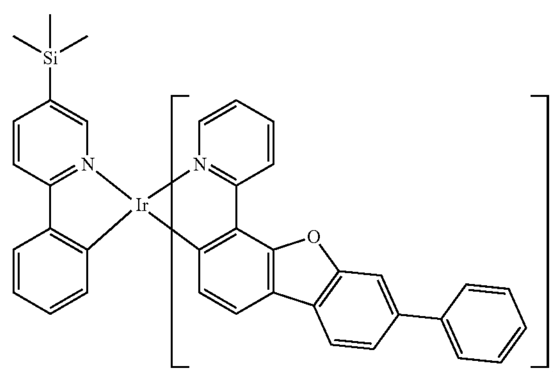
2822
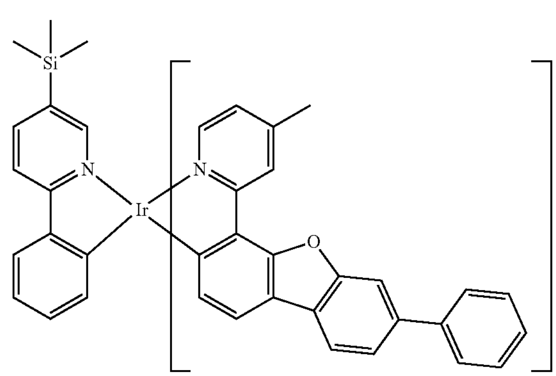

2823
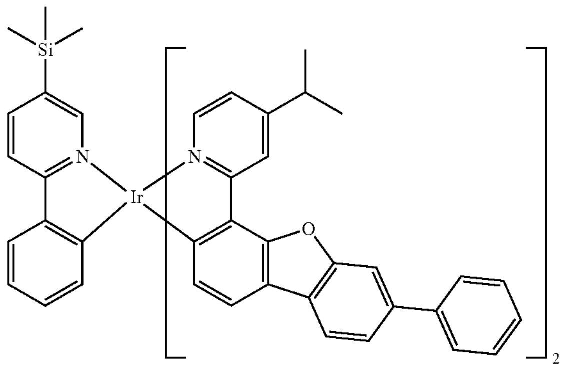
2824
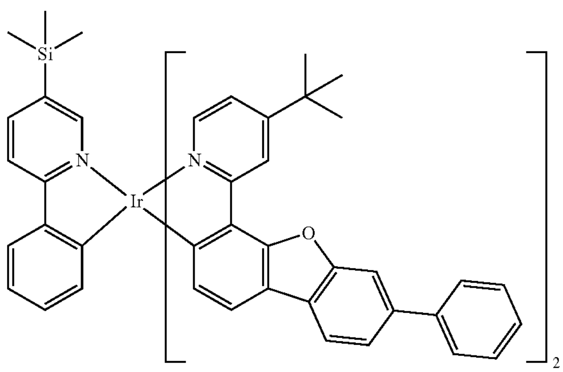
2825
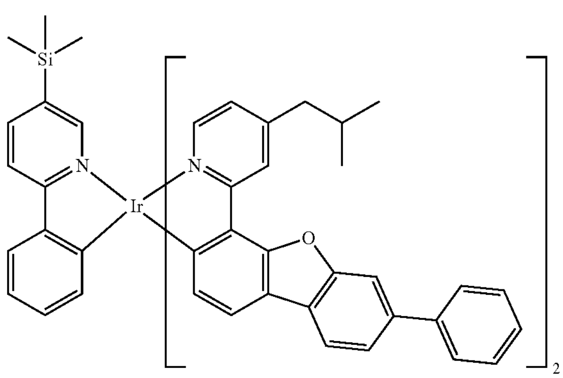
2826
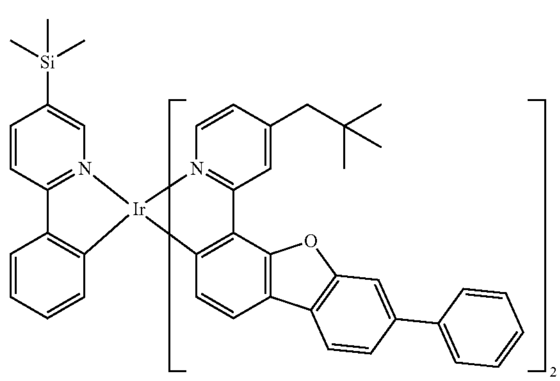
2827
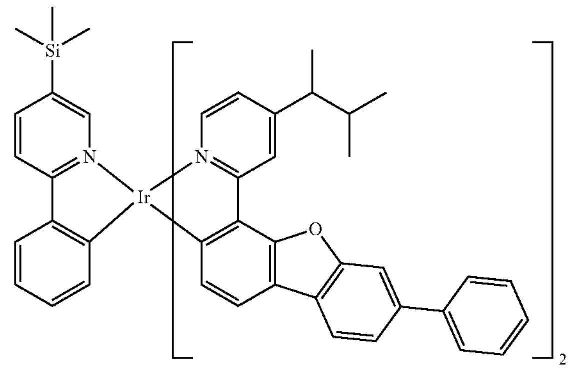
2828
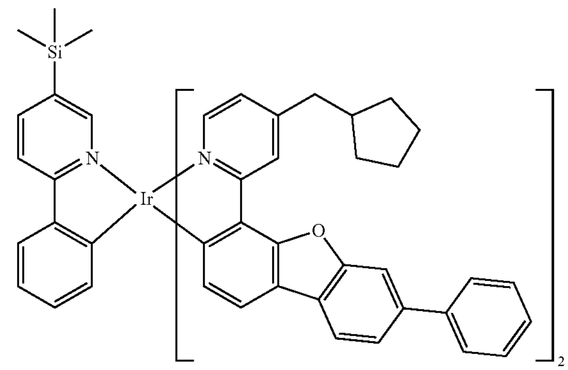
2829
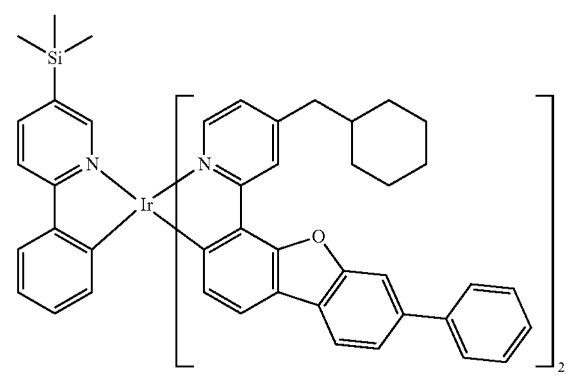
2830
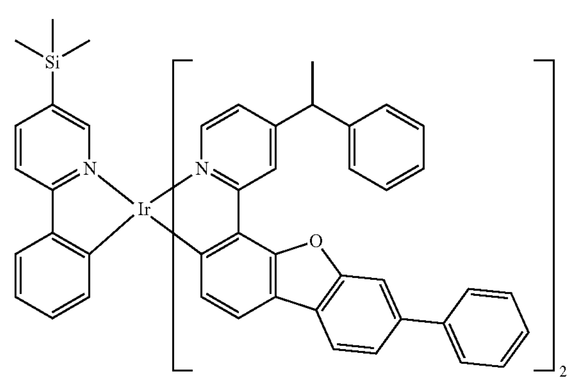

-continued
2831
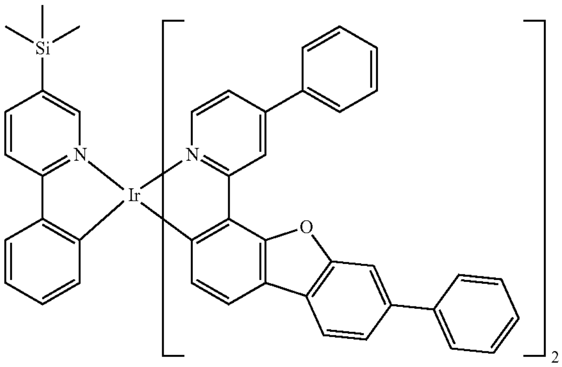
2832
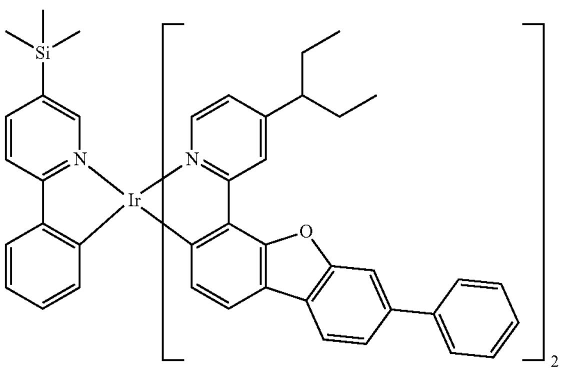
2833
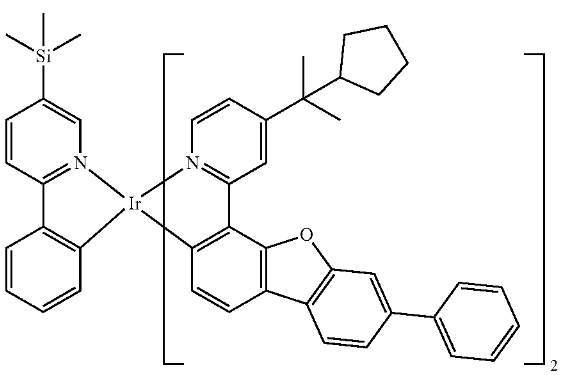
2834
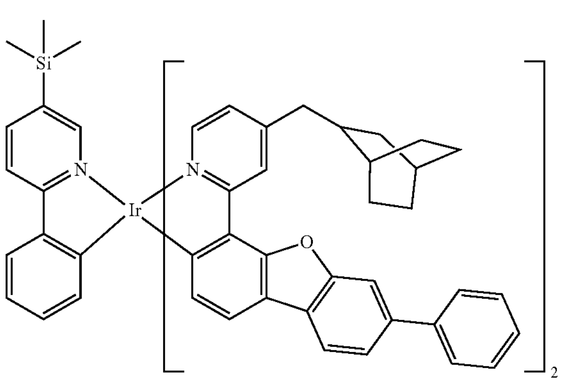
-continued
2835
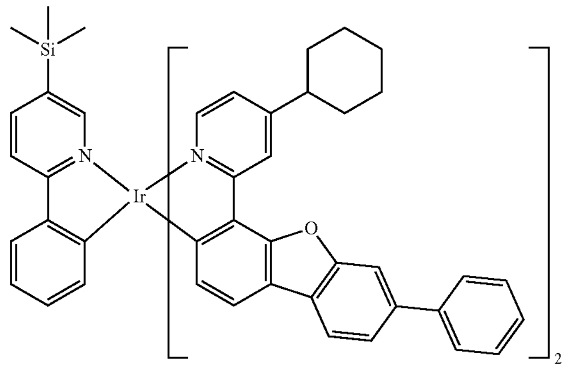
2836
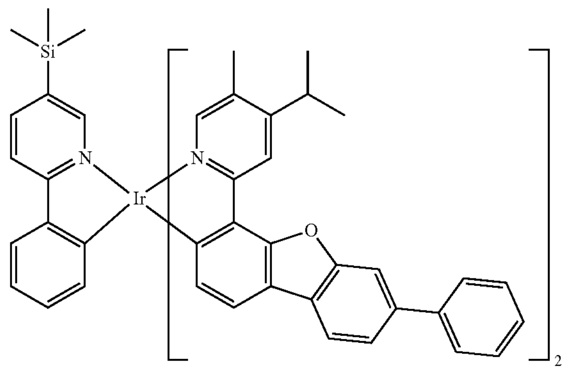
2837
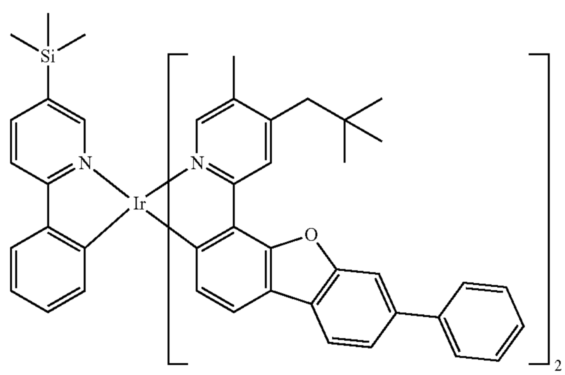
2838
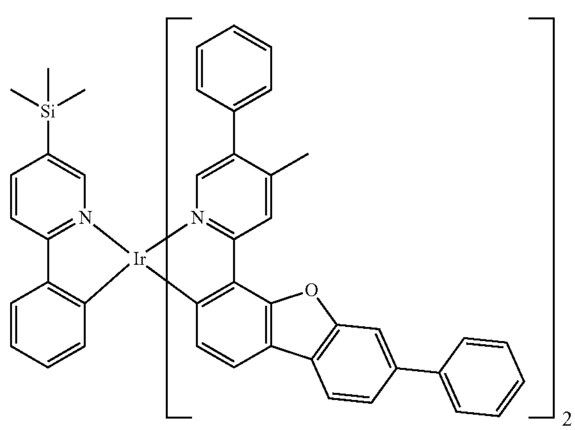

-continued
2839
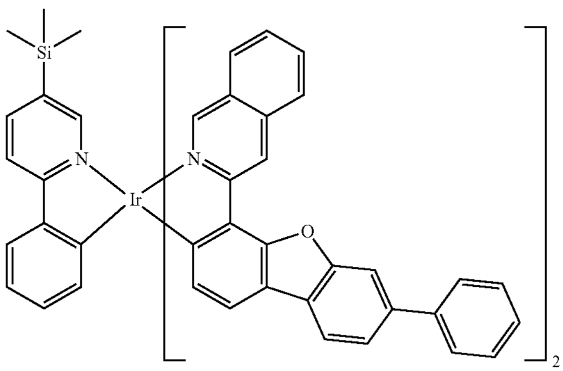
2840
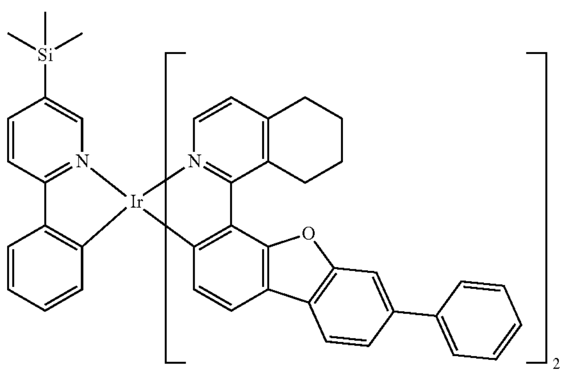
2841
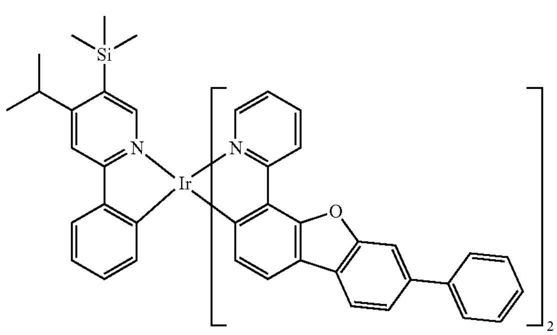
2842
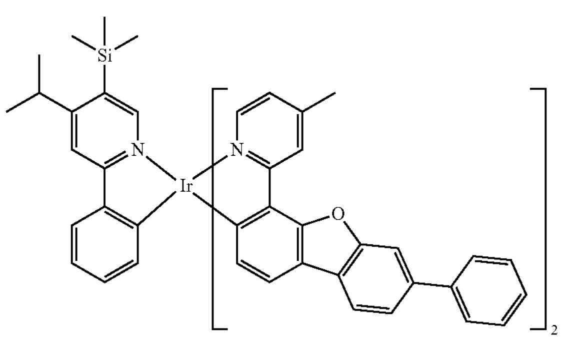
-continued
2843
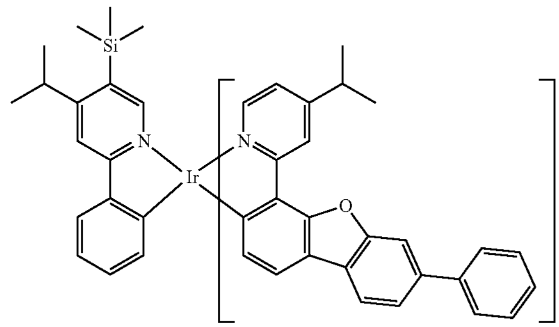
2844
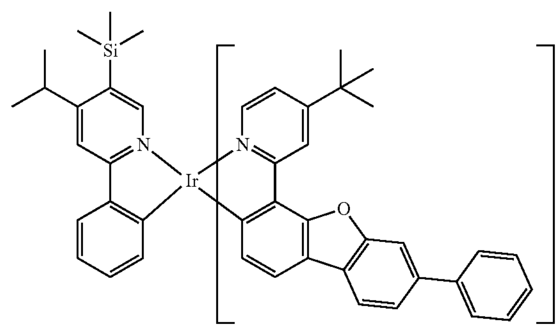
2845
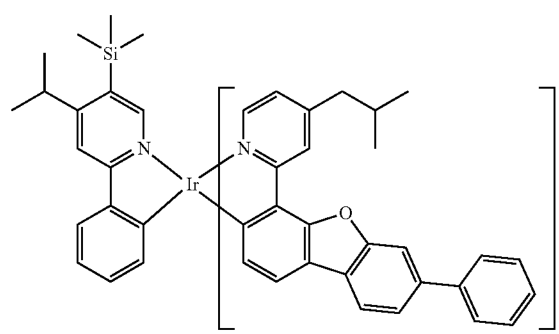
2846
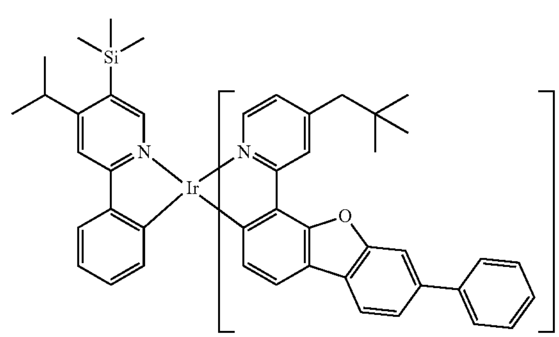

-continued
2847
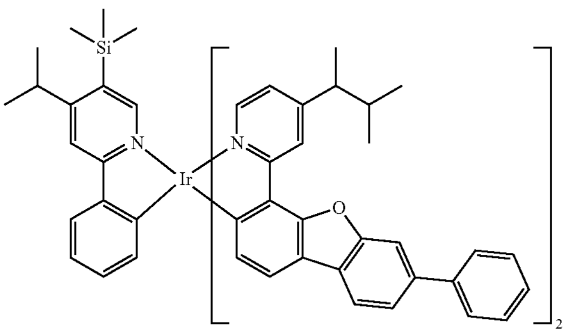
2848
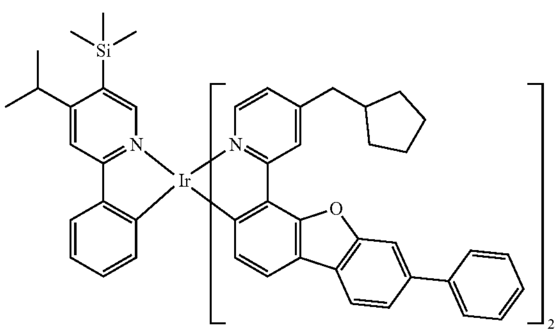
2849
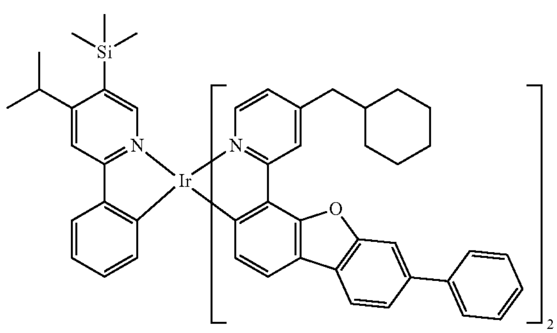
2850
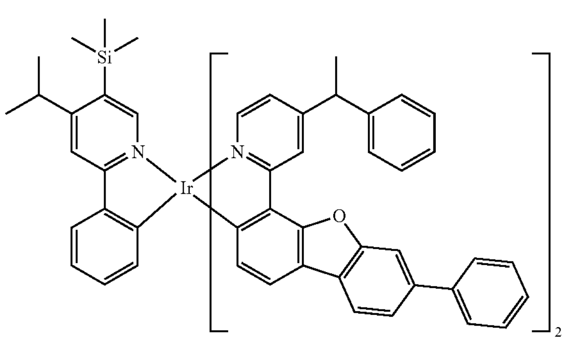
-continued
2851
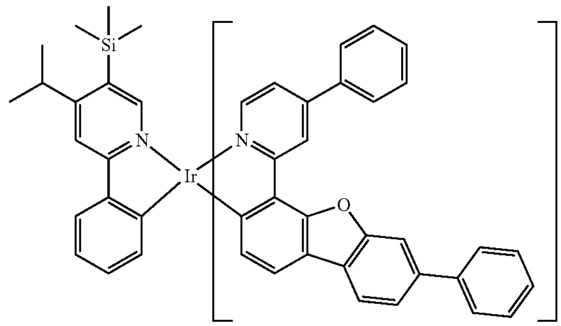
2852
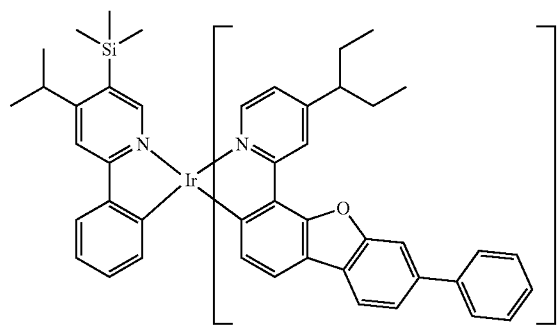
2853
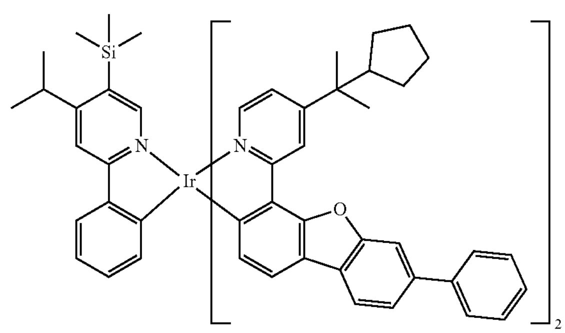
2854
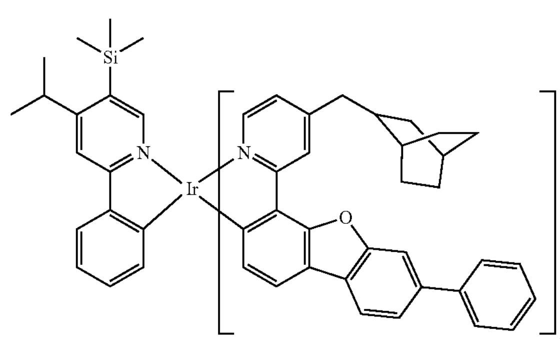

2855
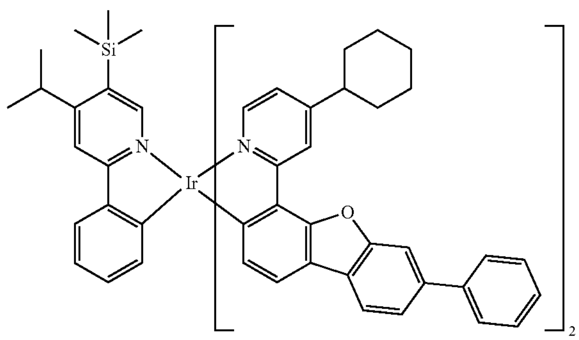
2856
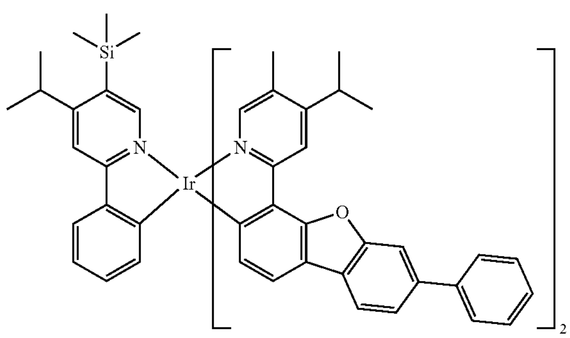
2857
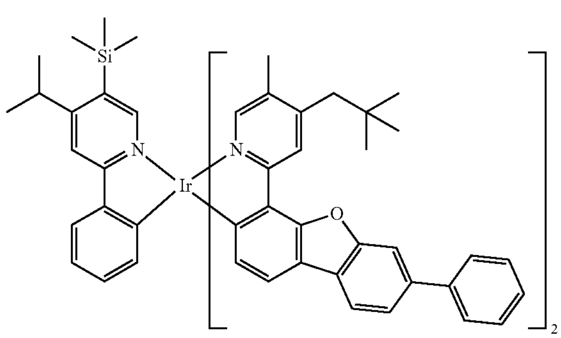
2858
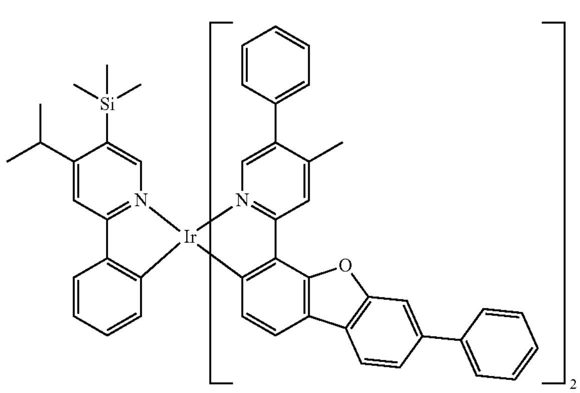
2859
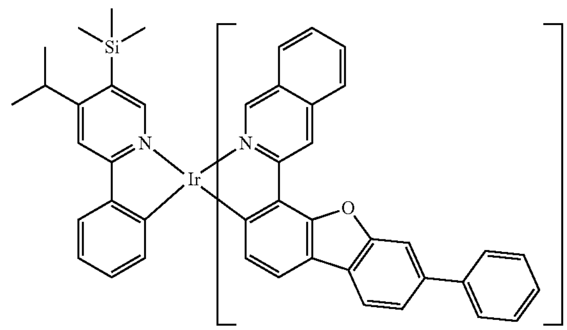
2860
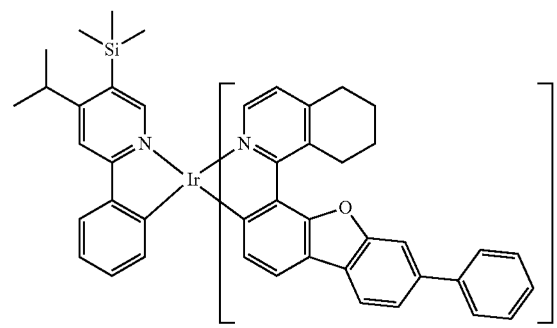
2861
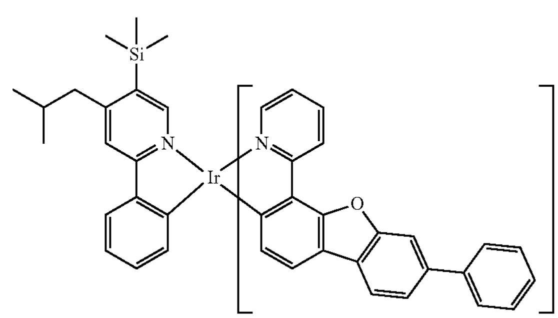
2862
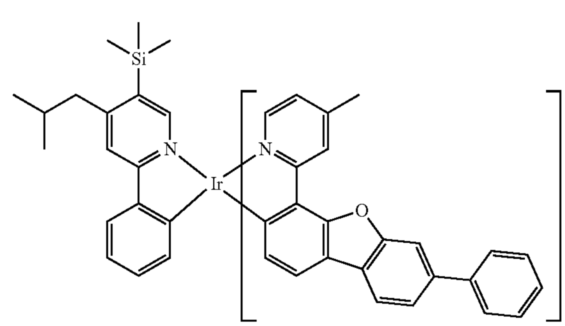

-continued
2863
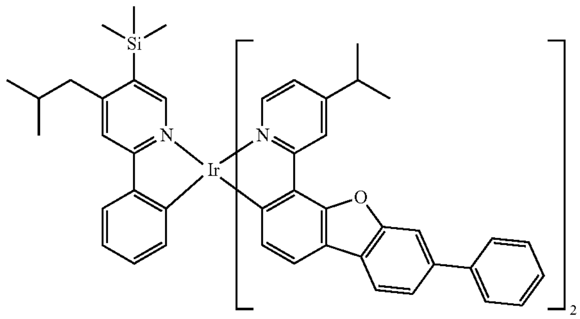
2864
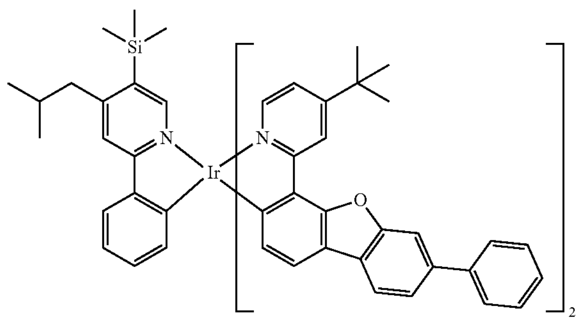
2865
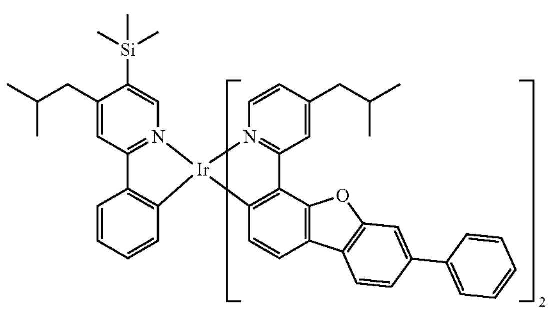
2866
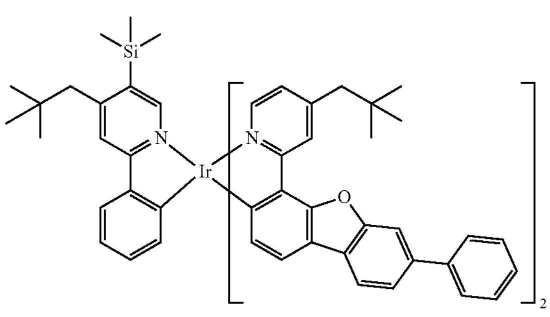
-continued
2867
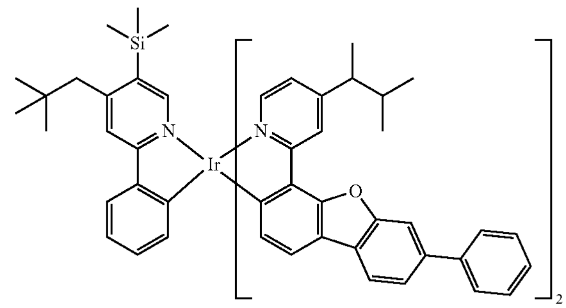
2868
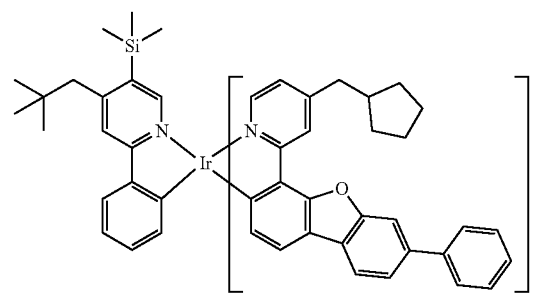
2869
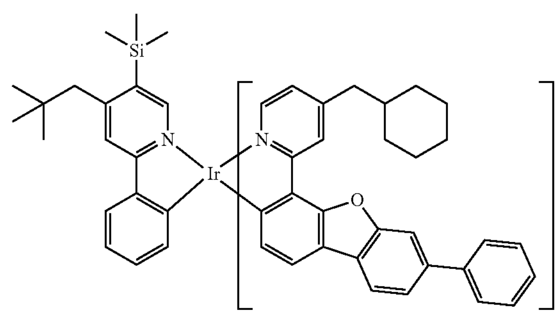
2870
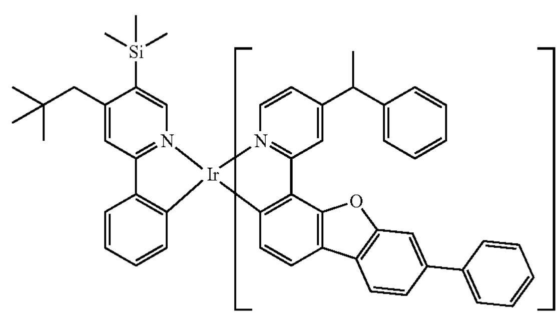
2871
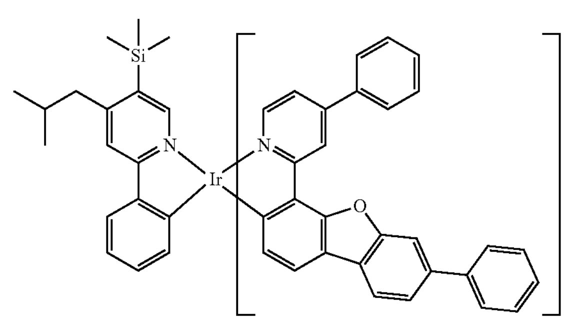

-continued
2872
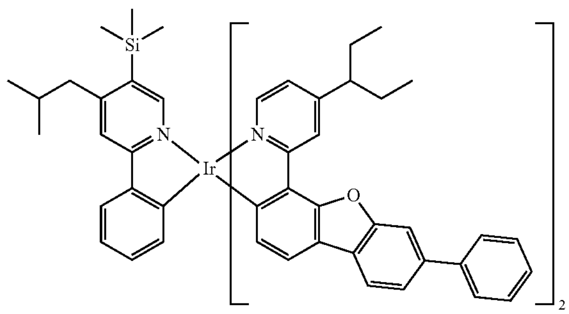
2873
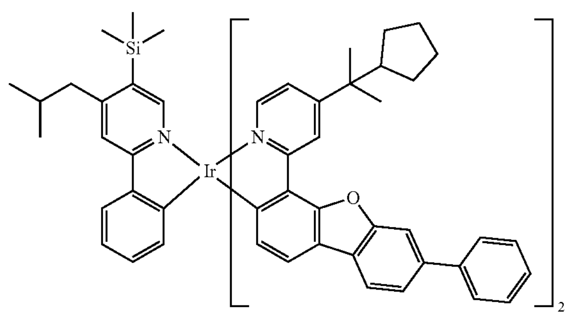
2874
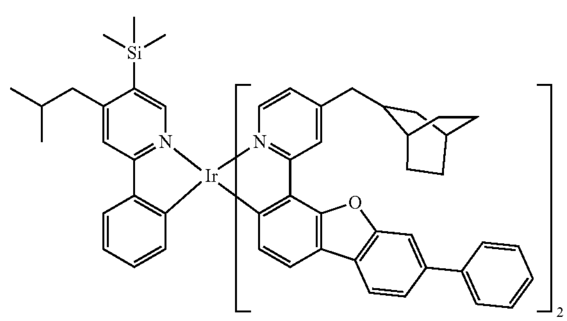
2875
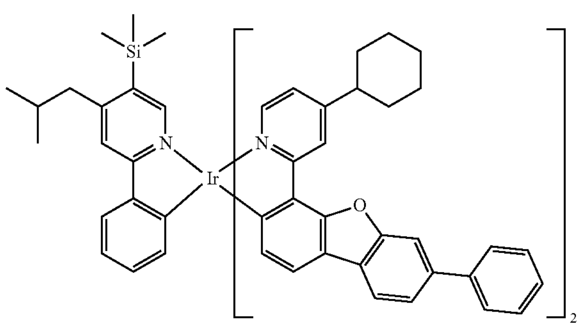
-continued
2876
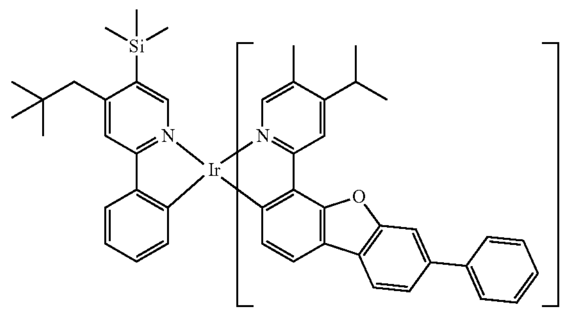
2877
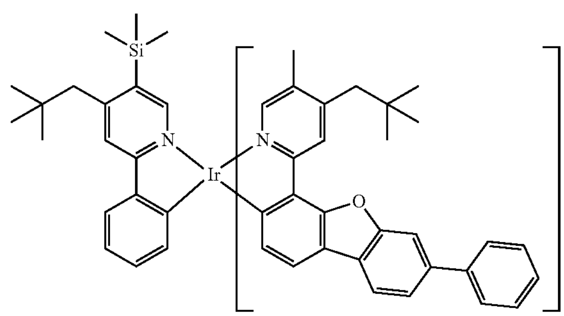
2878
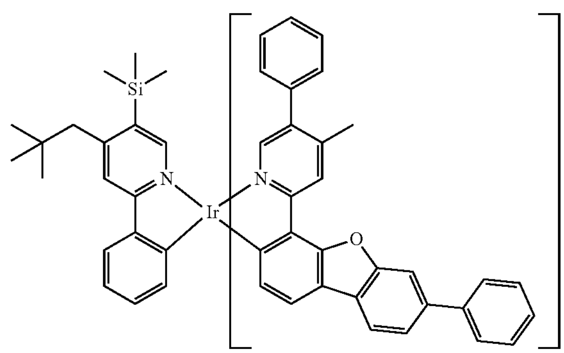
2879
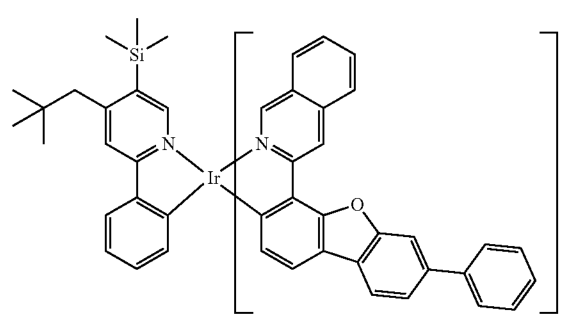

-continued
2880
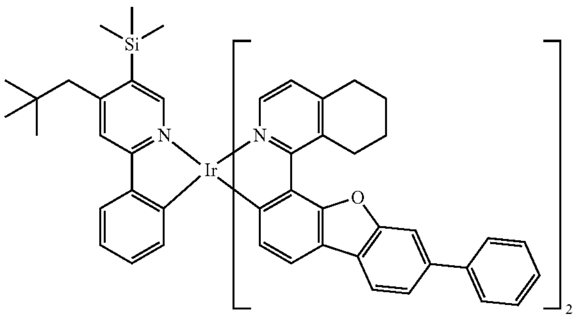
2881
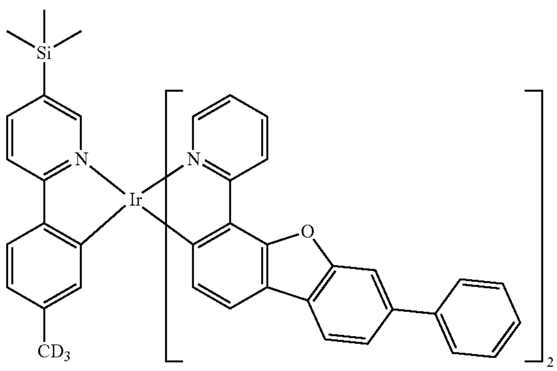
2882
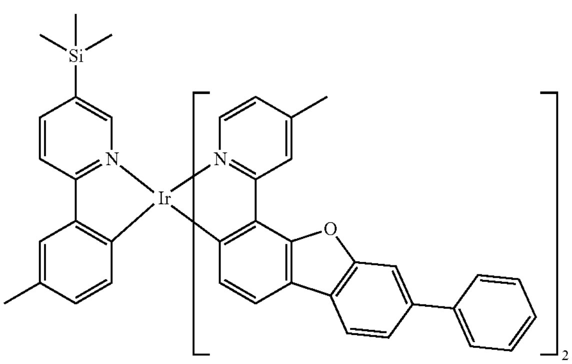
2883
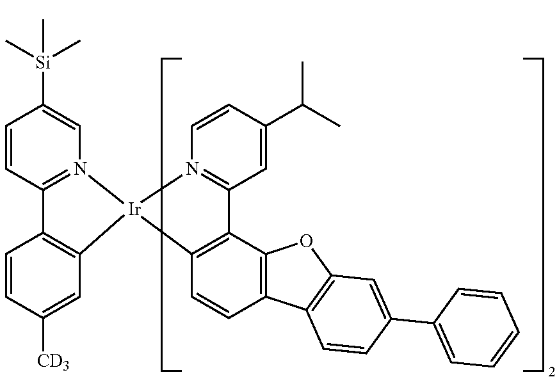
-continued
2884
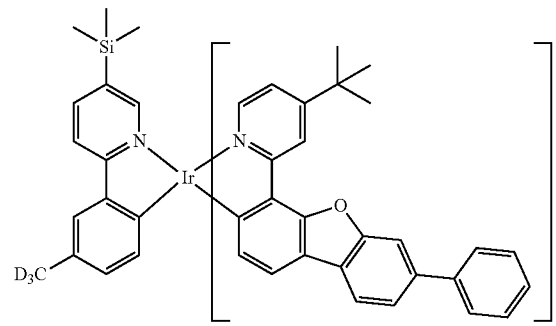
2885
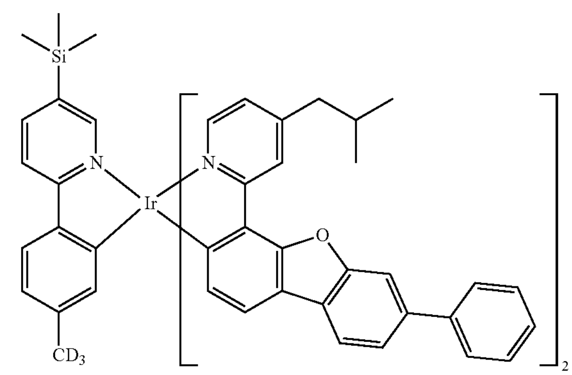
2886
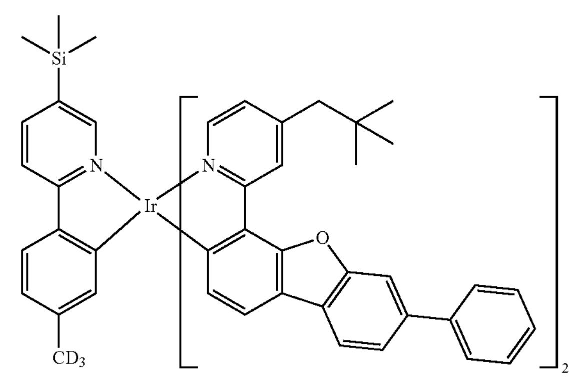
2887
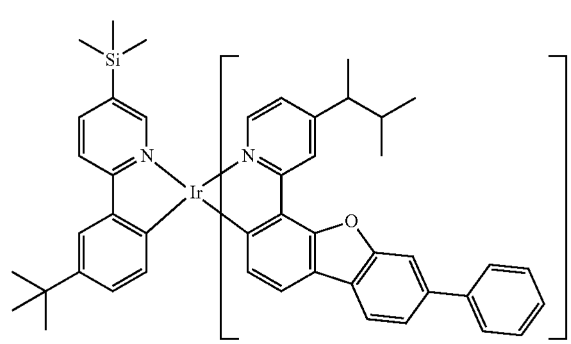

-continued
2888
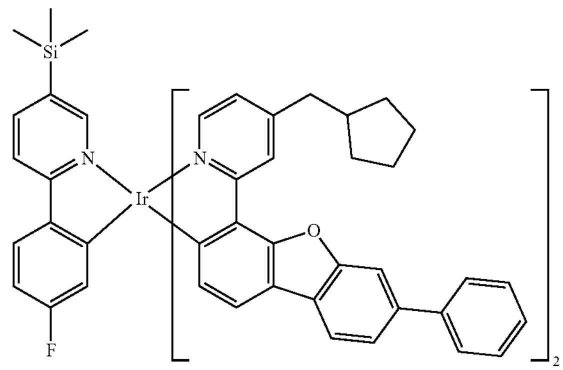
2889
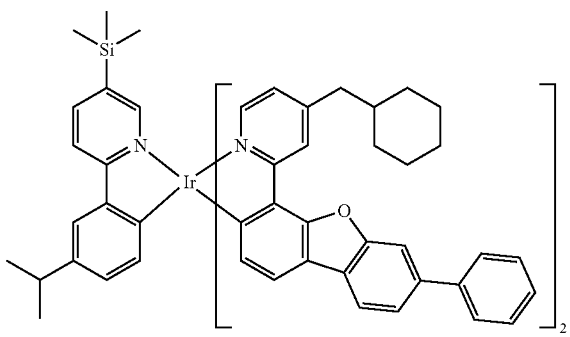
2890
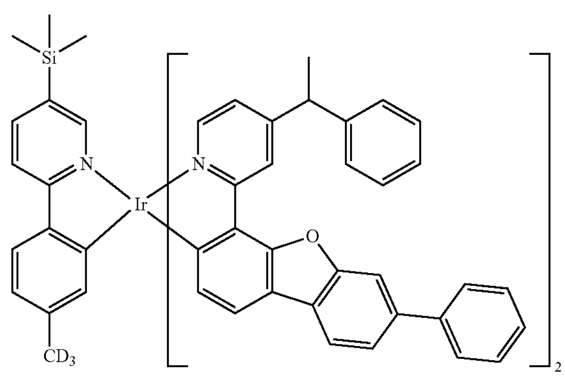
2891
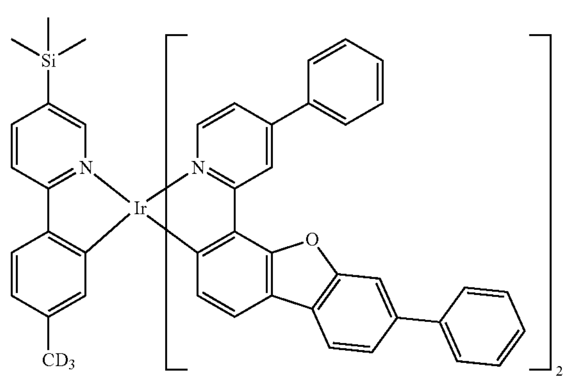
-continued
2892
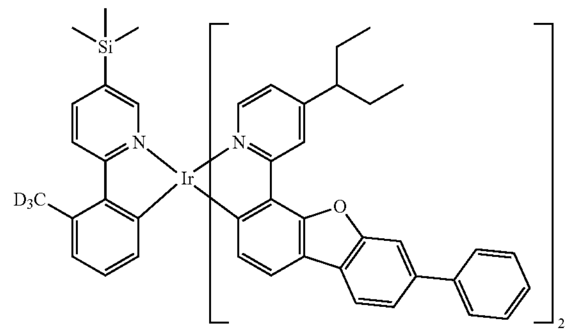
2893
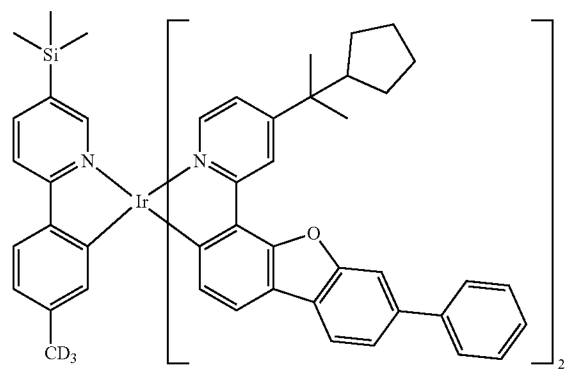
2894
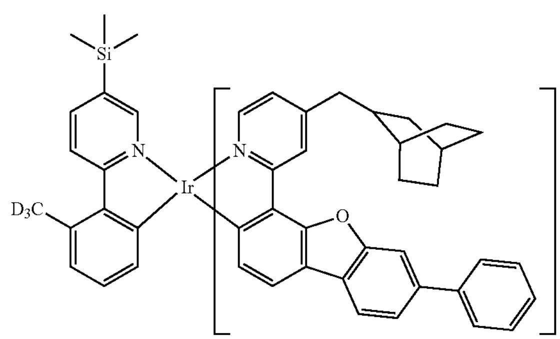
2895
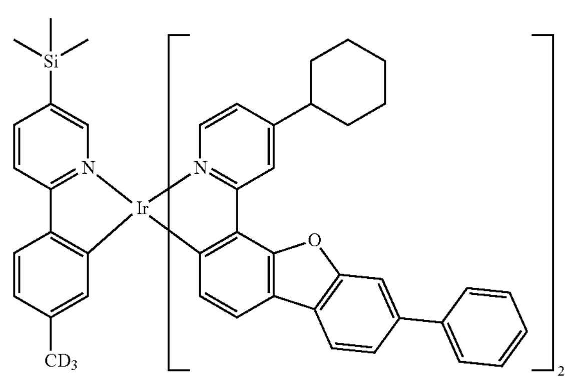

-continued
2896
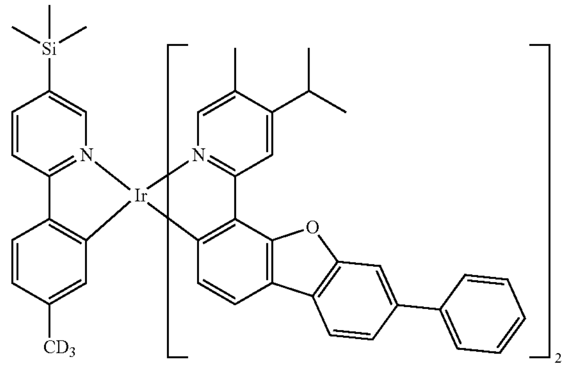
2897
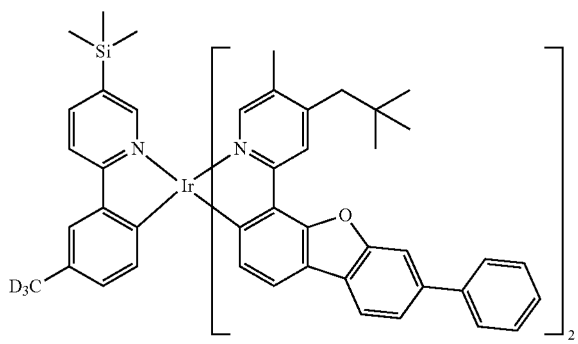
2898
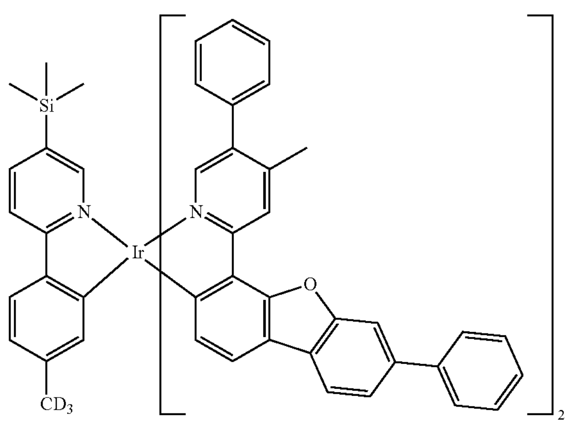
2899
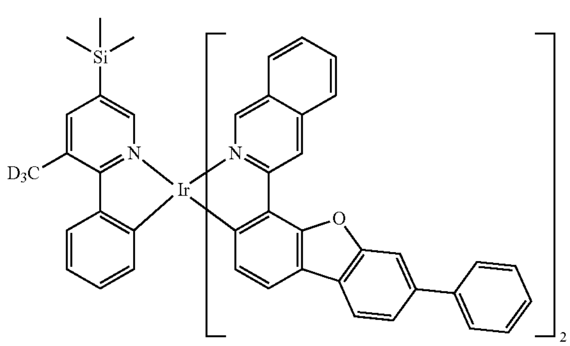
-continued
2900
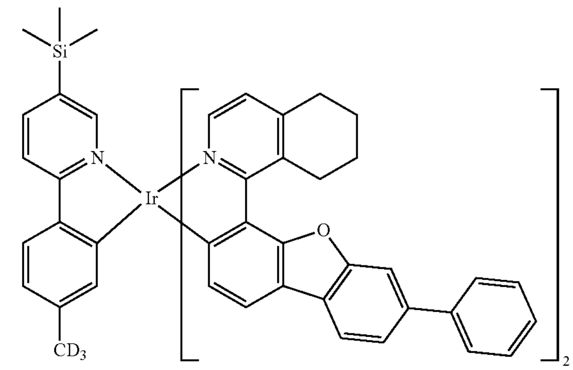
2901
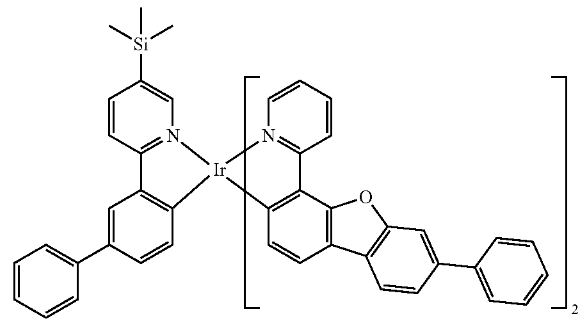
2902
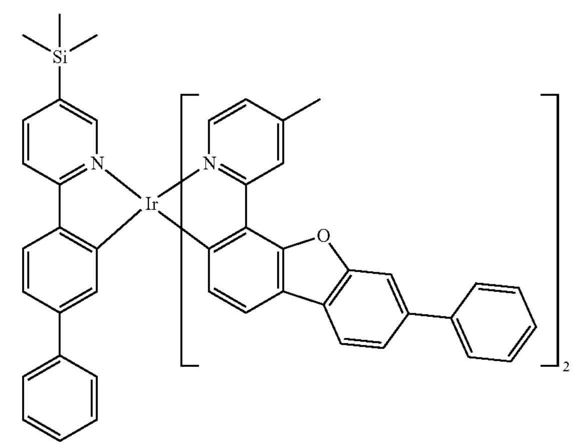
2903
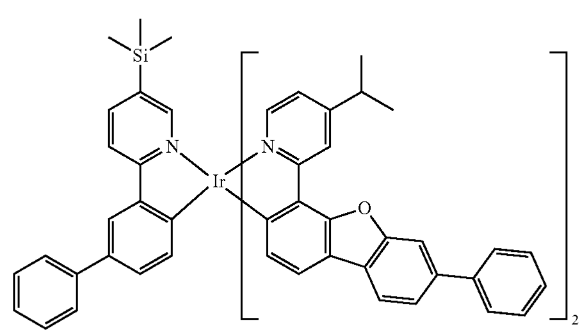

2904
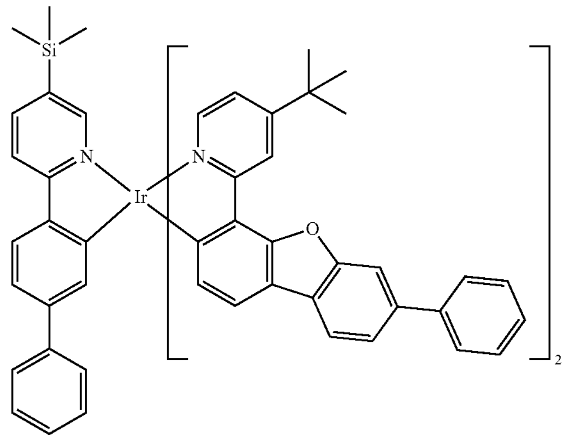
2905
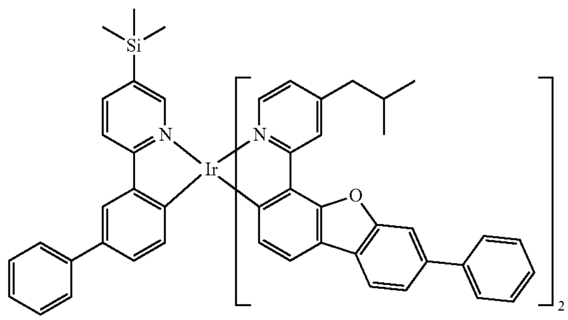
2906
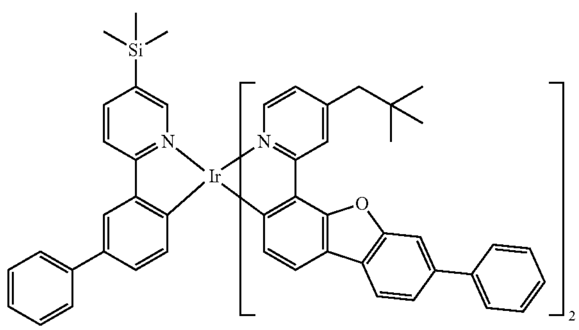
2907
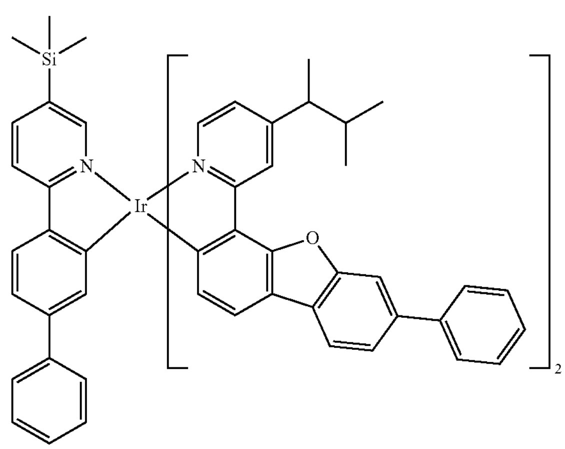
2908
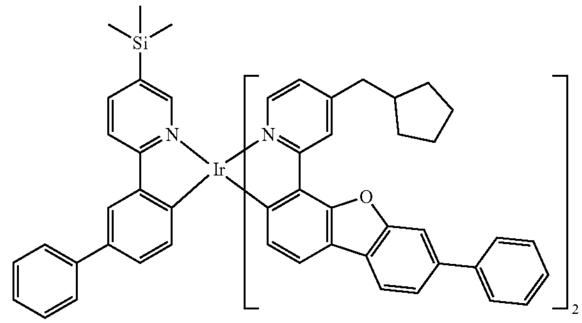
2909
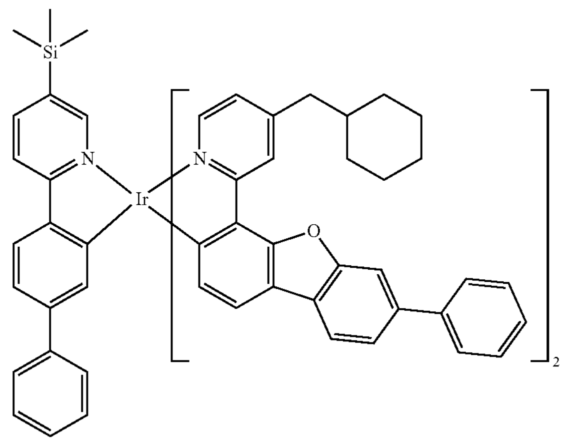
2910
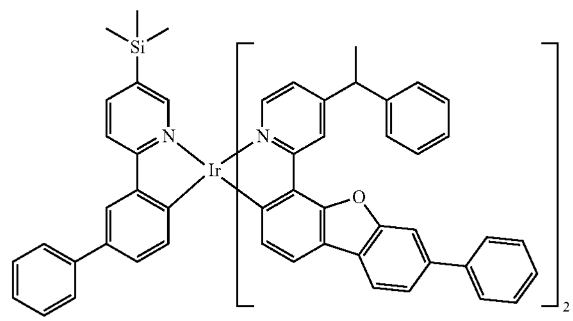
2911
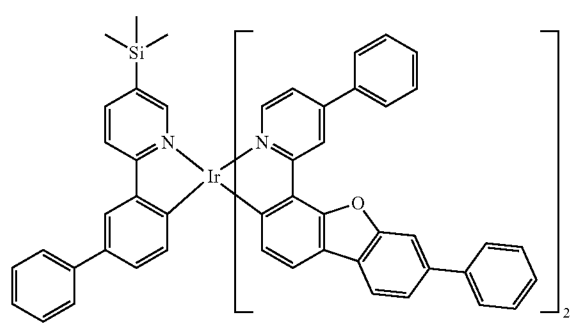

-continued
2912
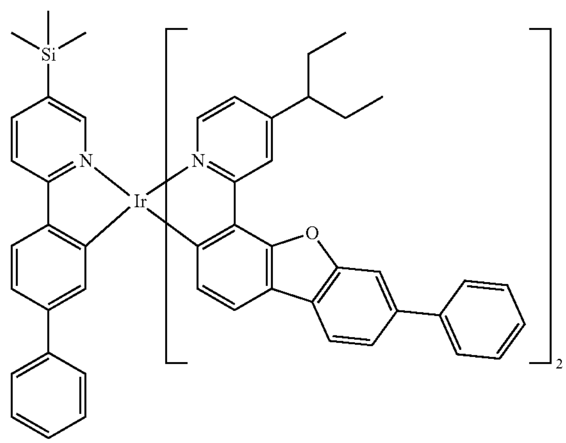
2913
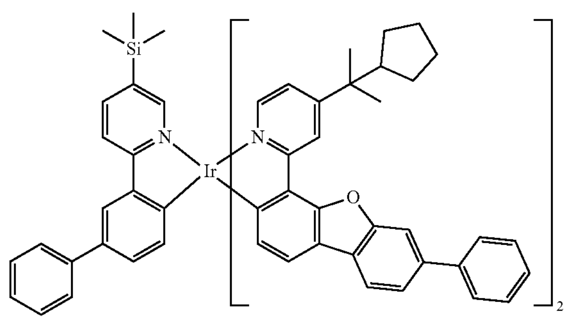
2914
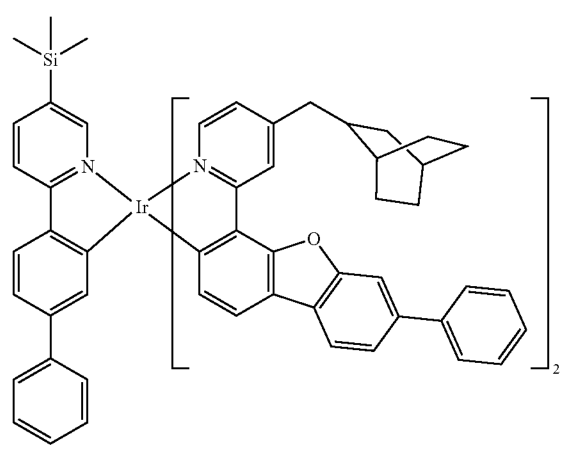
2915
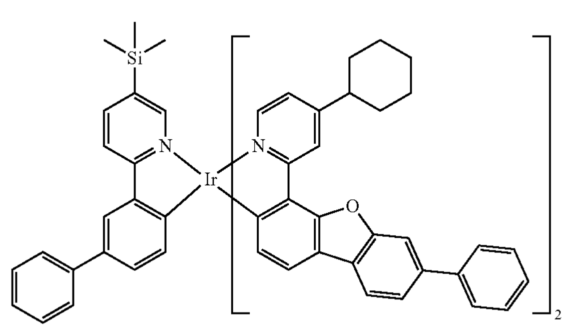
-continued
2916
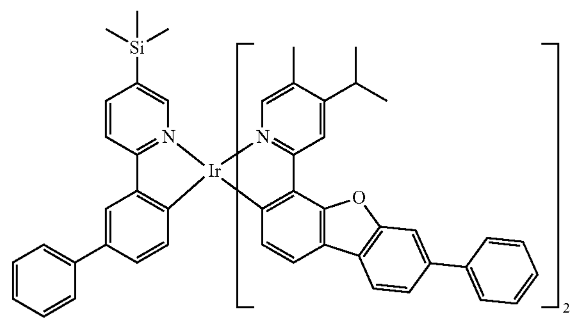
2917
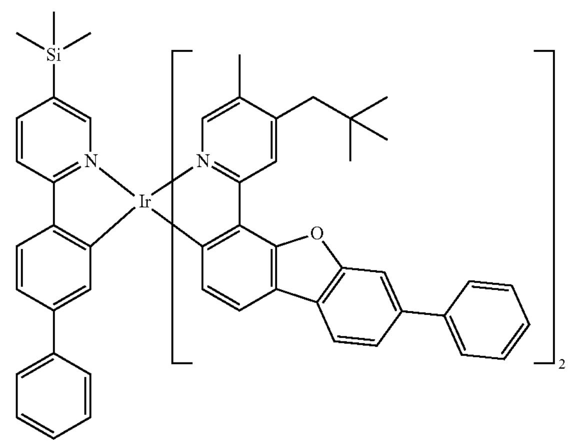
2918
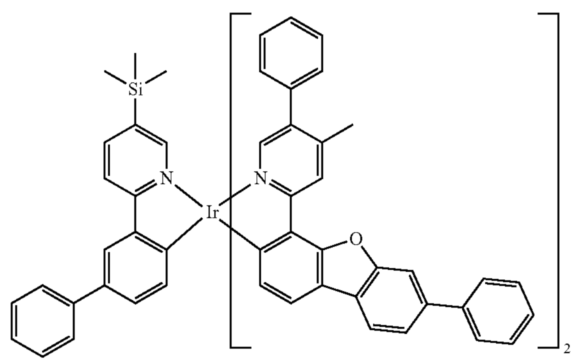
2919
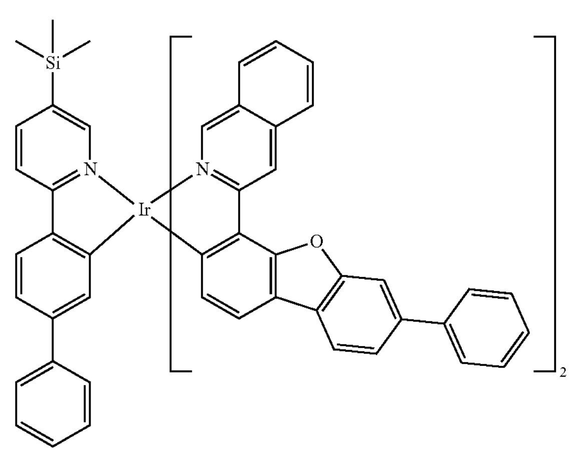

-continued
2920
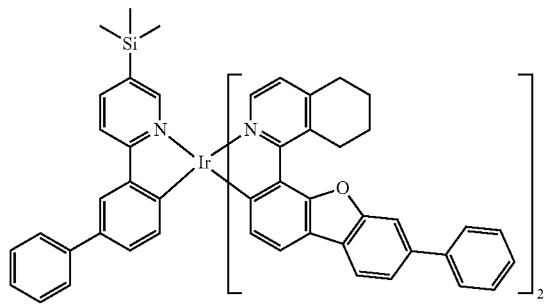
2921
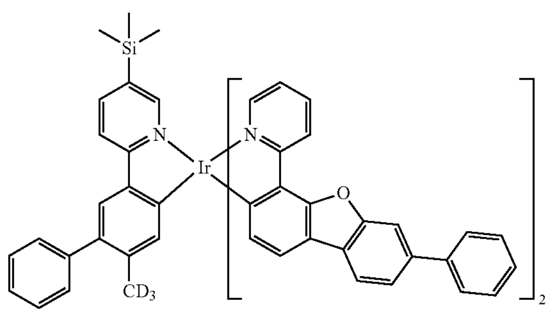
2922
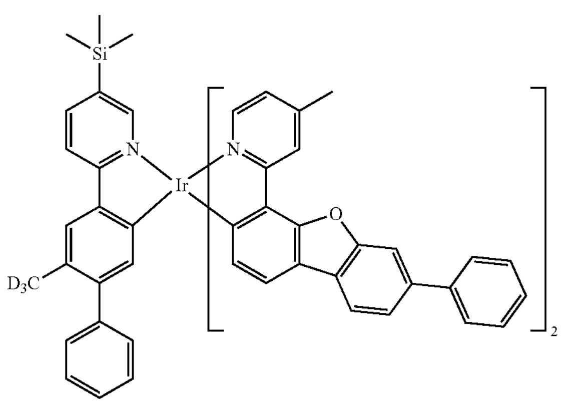
2923
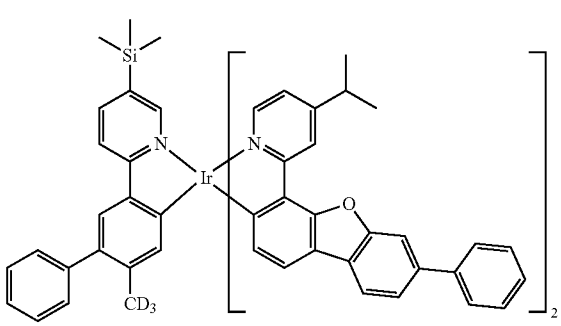
-continued
2924
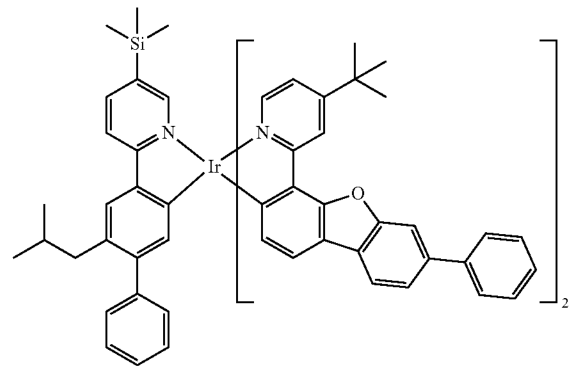
2925
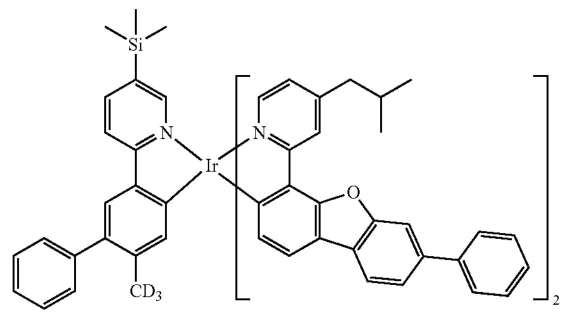
2926
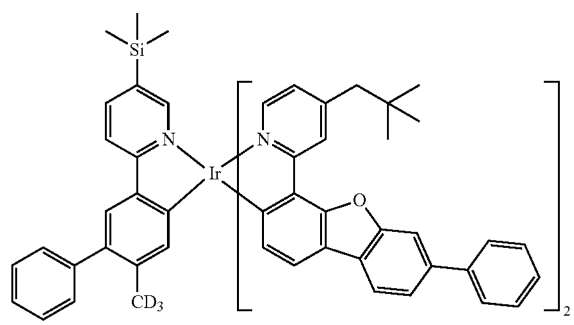
2927
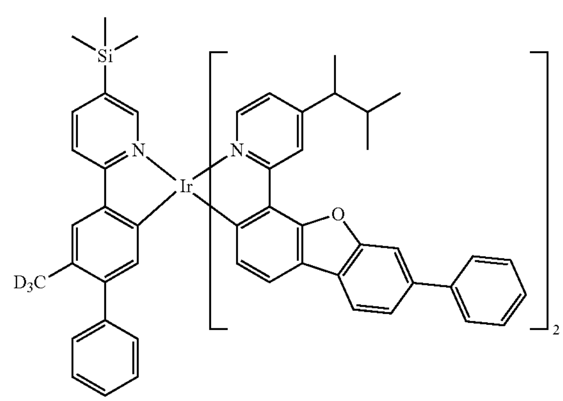

-continued
2928
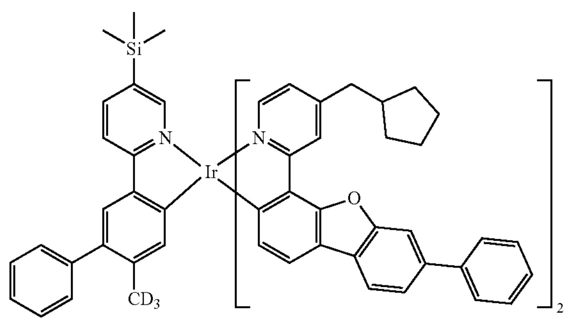
2929
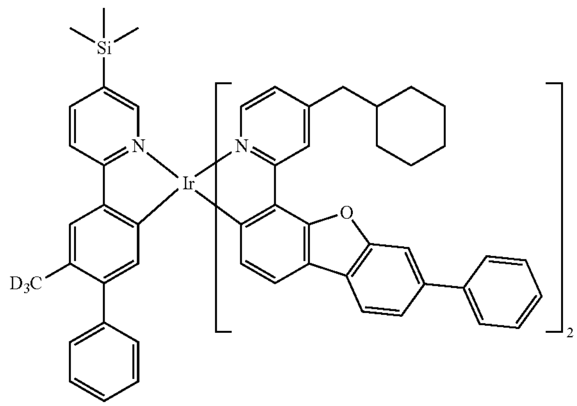
2930
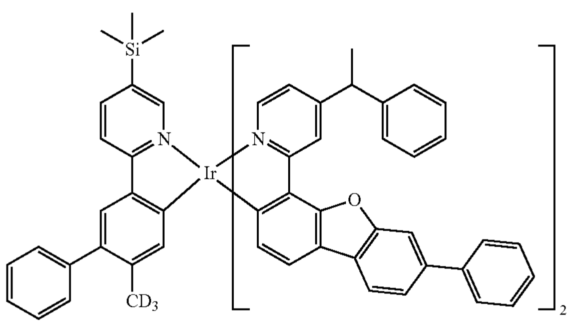
2931
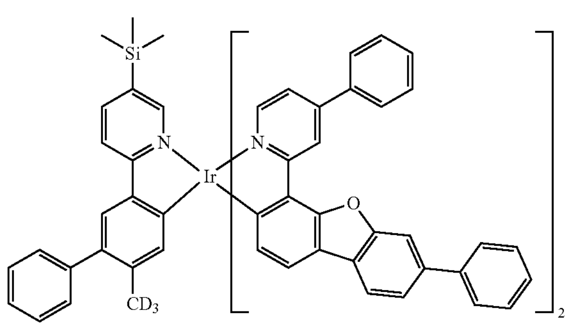
-continued
2932
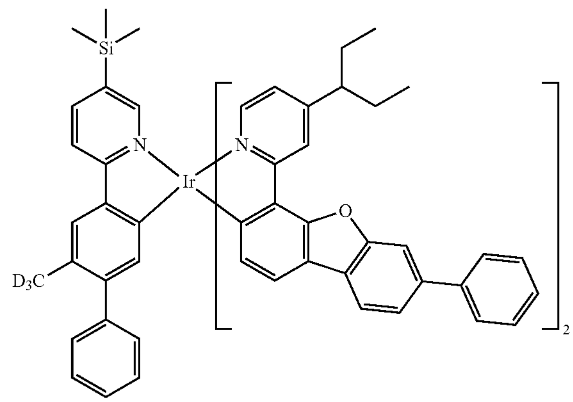
2933
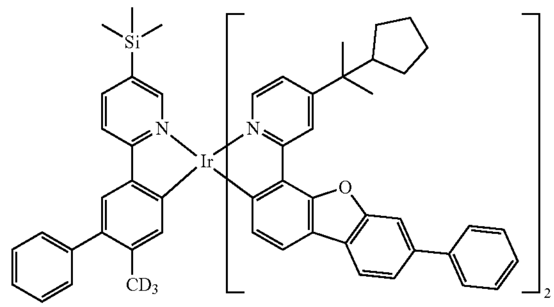
2934
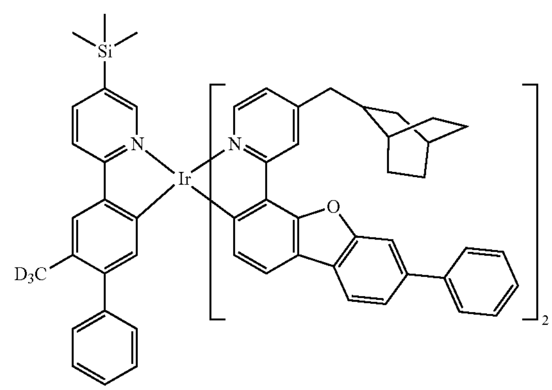
2935
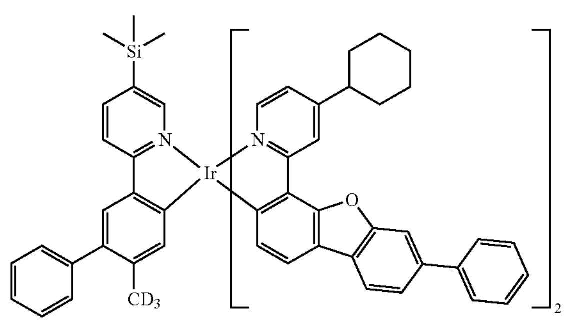

-continued
2936
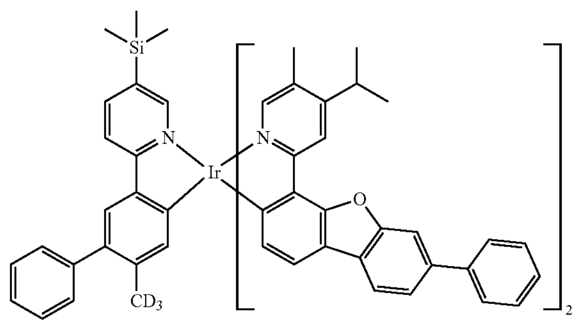
2937
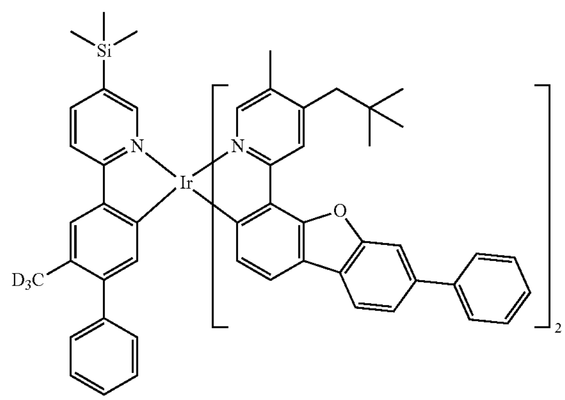
2938
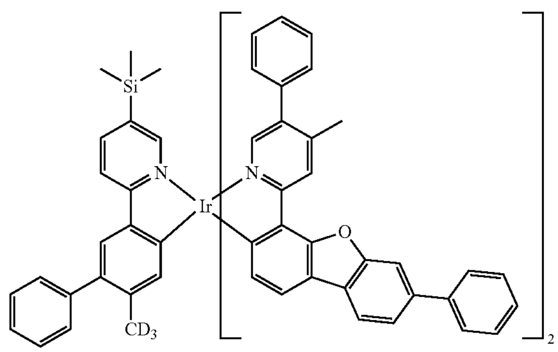
2939
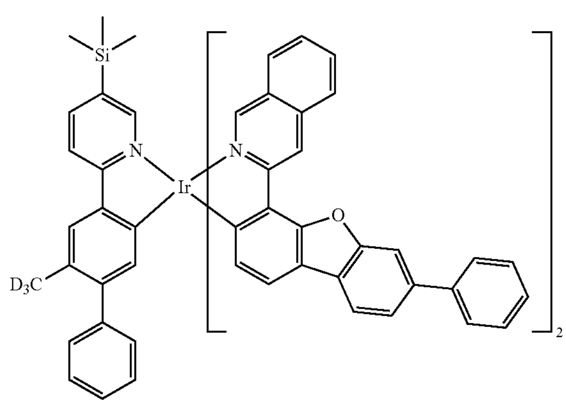
-continued
2940
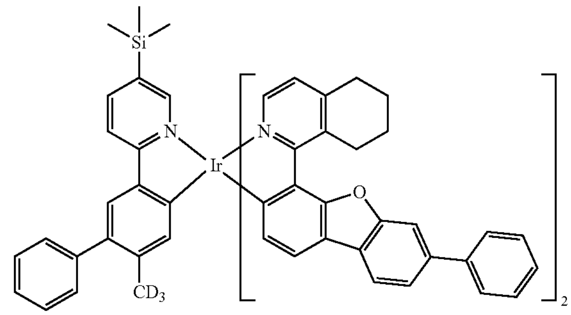
2941
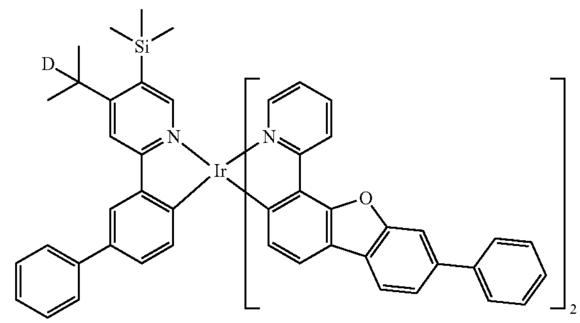
2942
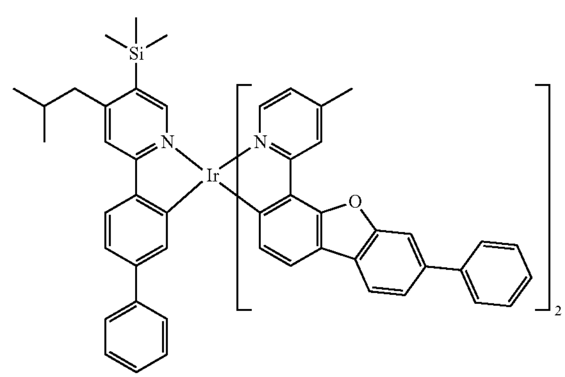
2943
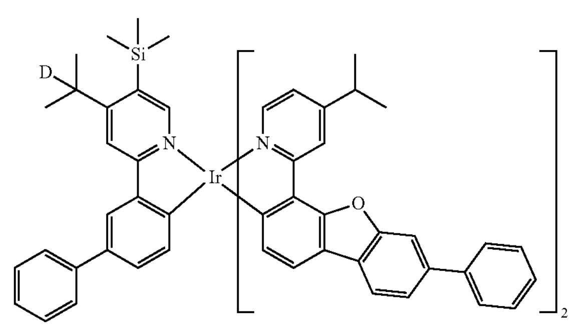

-continued
2944
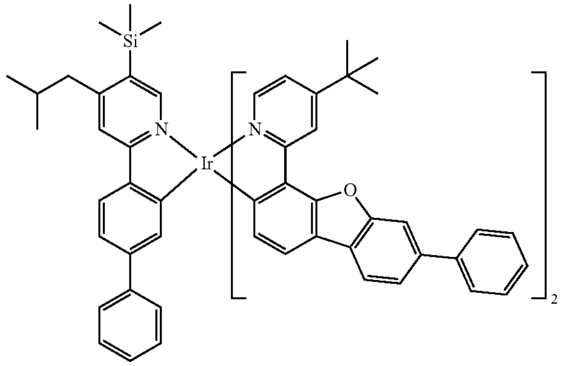
2945
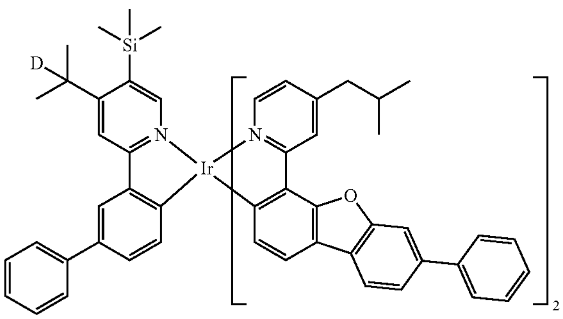
2946
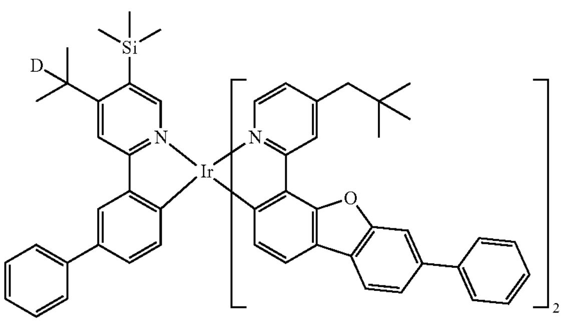
2947
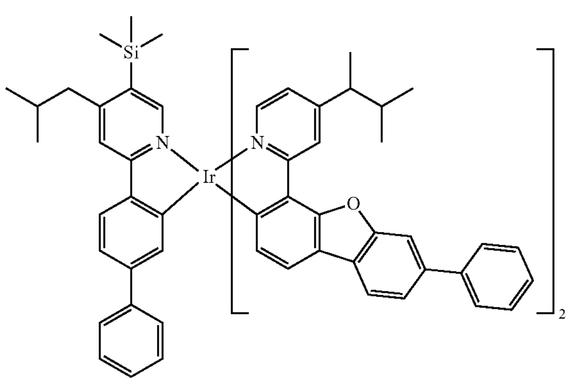
-continued
2948
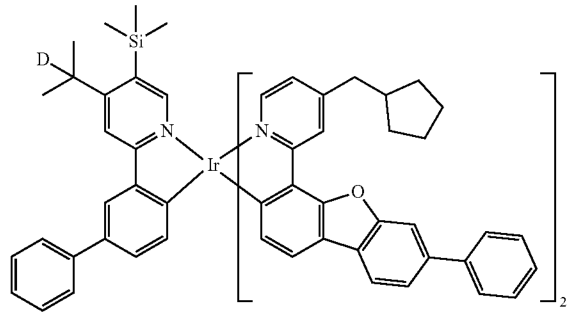
2949
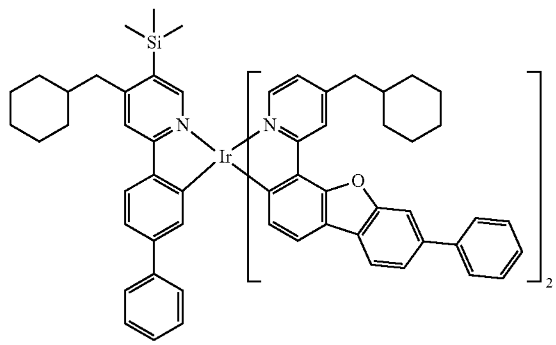
2950
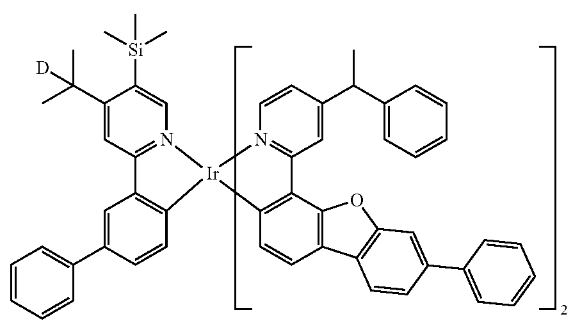
2951
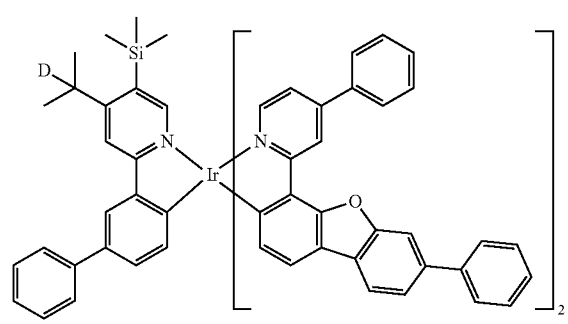

-continued
2952
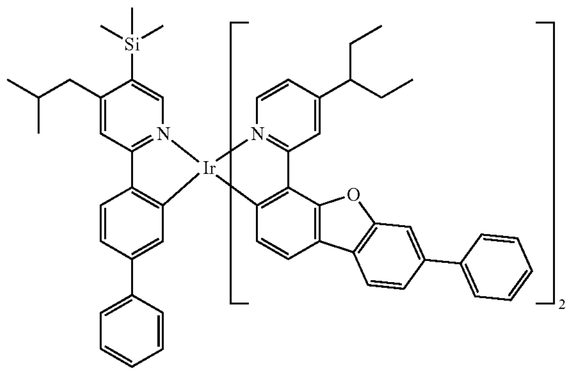
2953
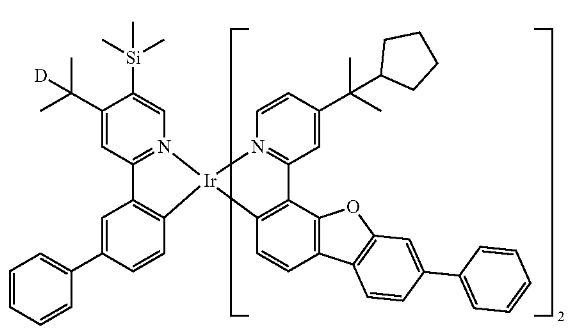
2954
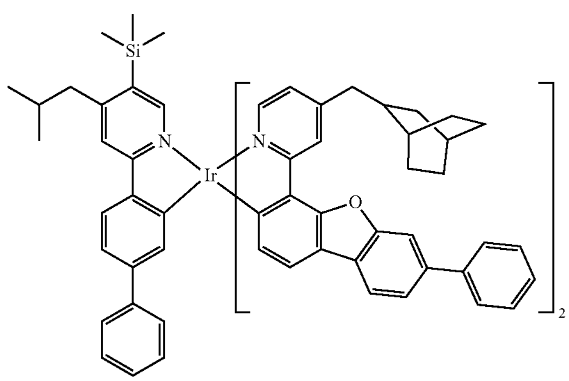
2955
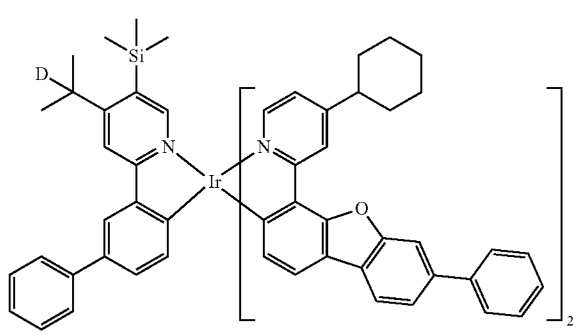
-continued
2956
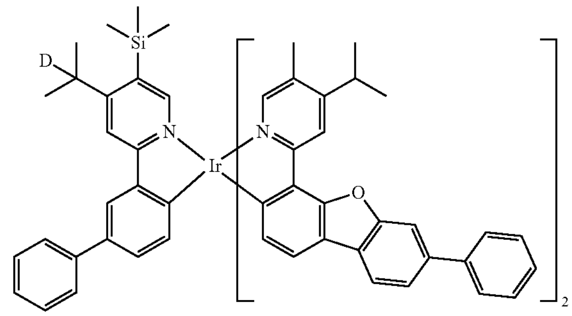
2957
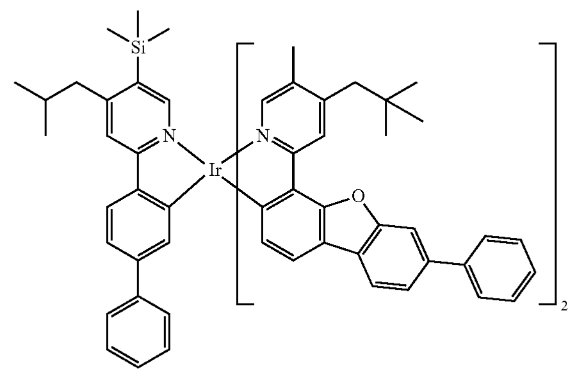
2958
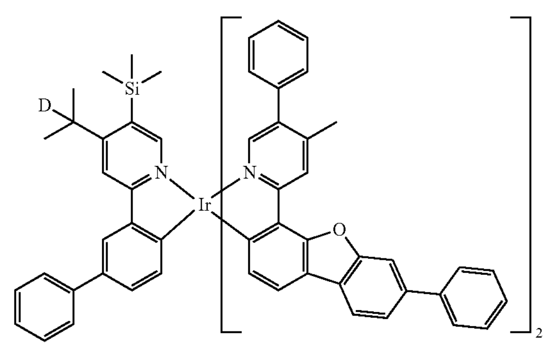
2959
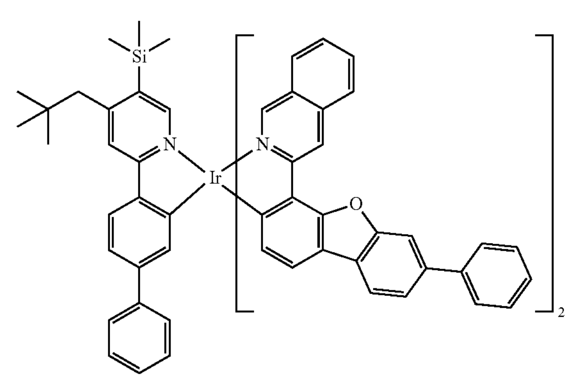

-continued
2960
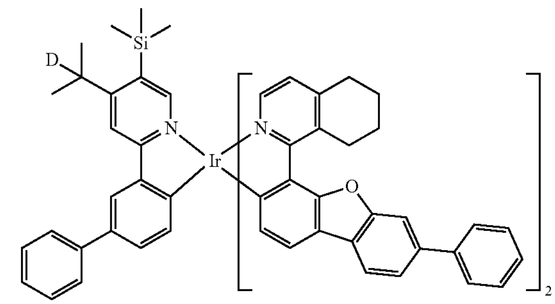
2961
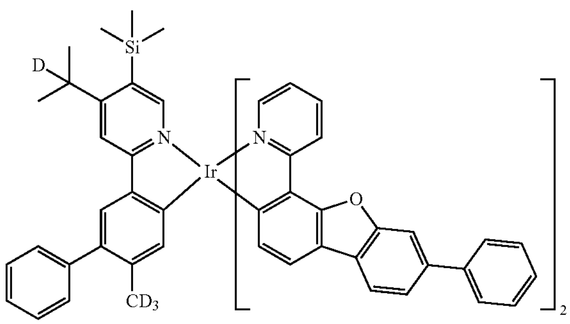
2962
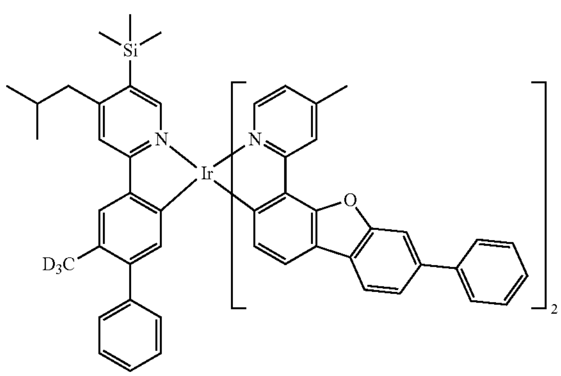
2963
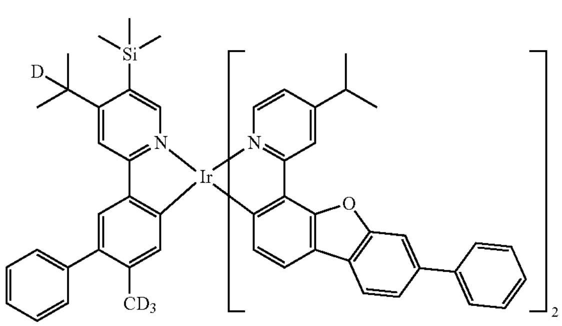
-continued
2964
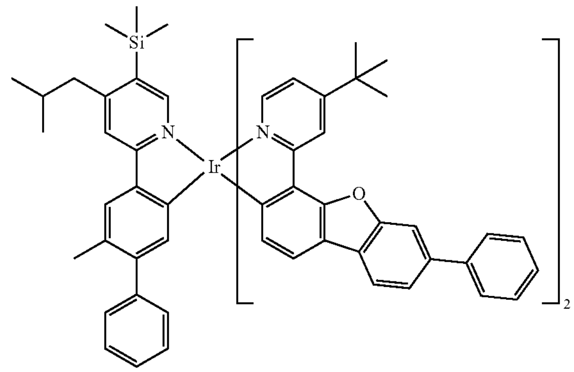
2965
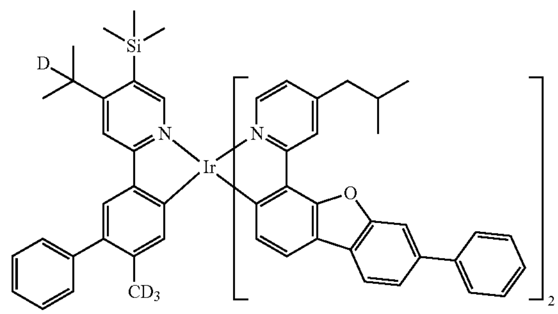
2966
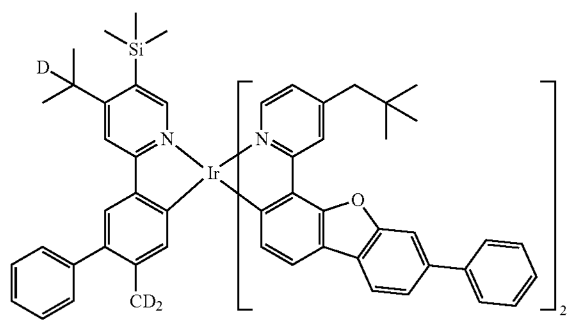
2967
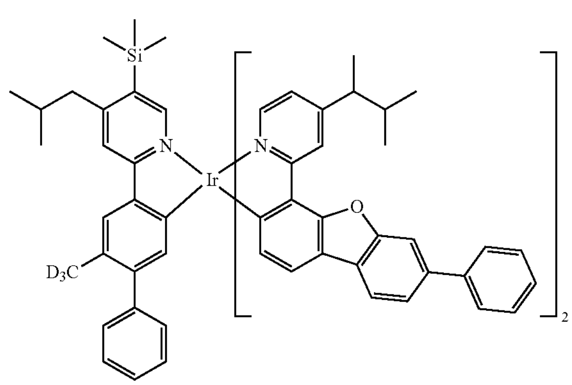

-continued
2968
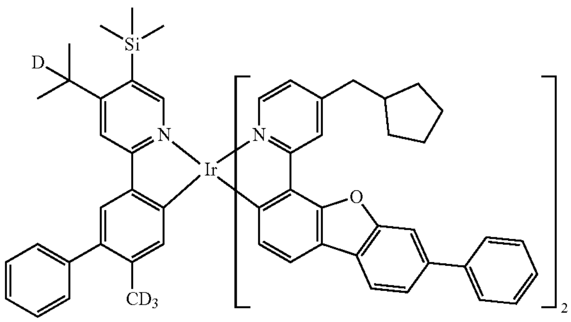
2969
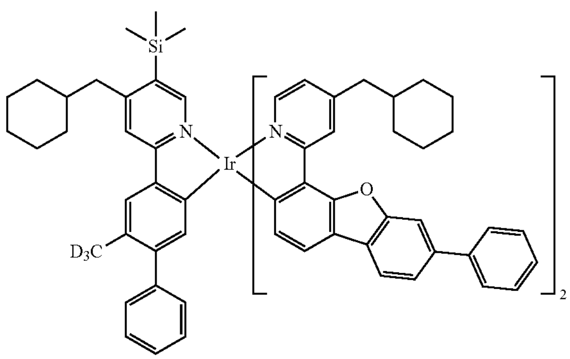
2970
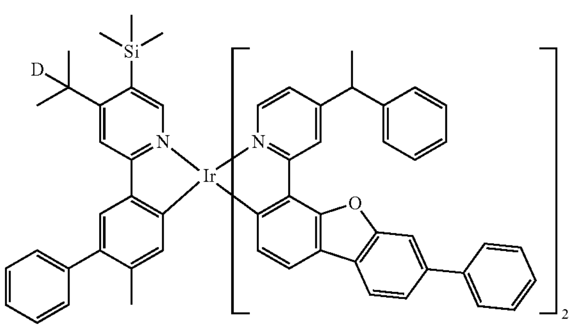
2971
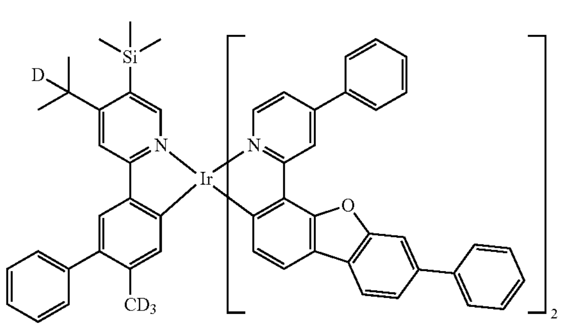
-continued
2972
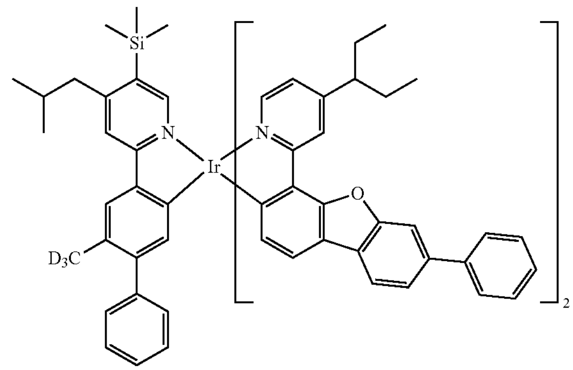
2973
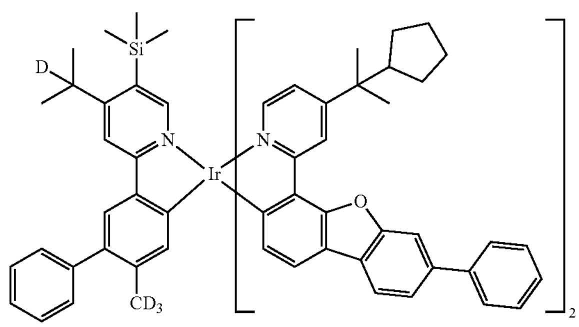
2974
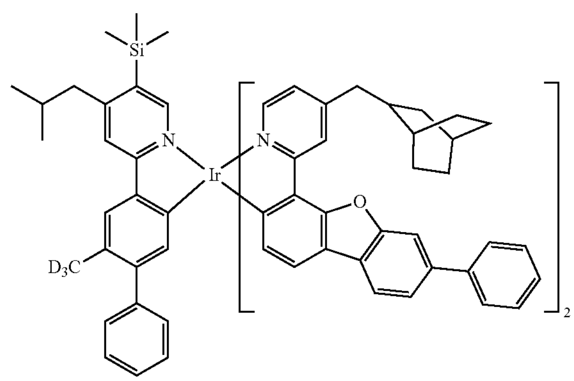
2975
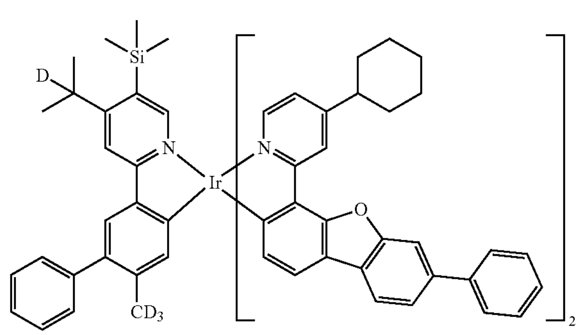

-continued
2976
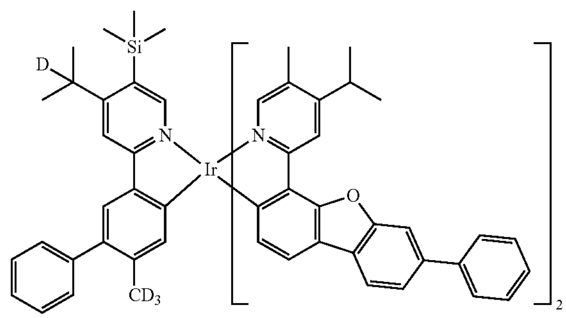
2977
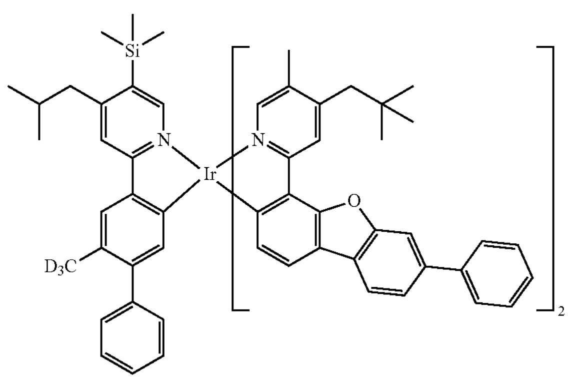
2978
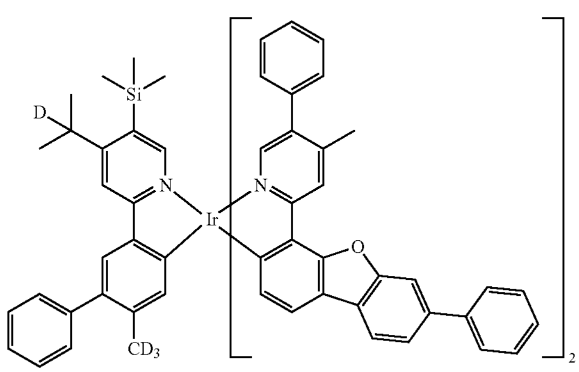
2979
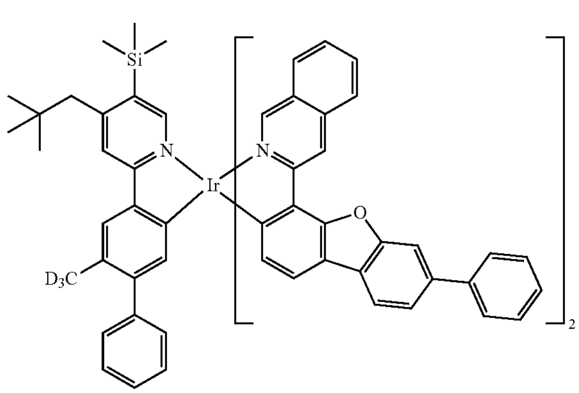
-continued
2980
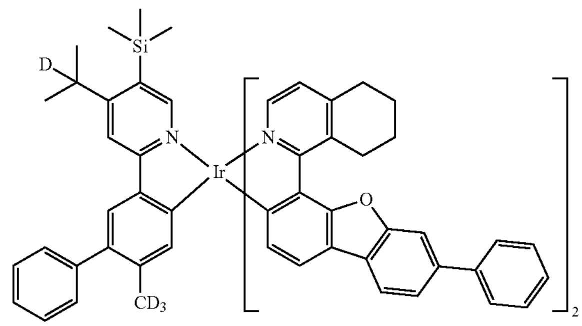
2981
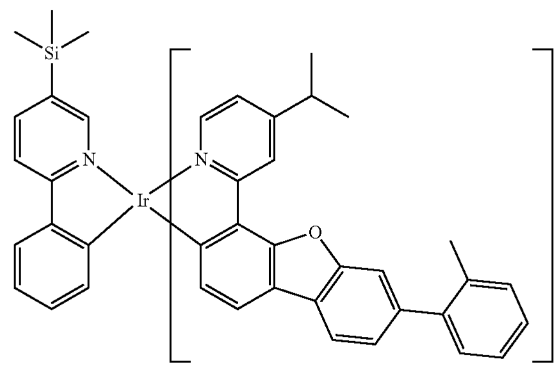
2982
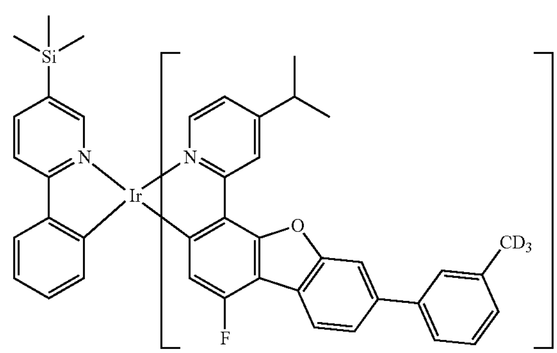
2983
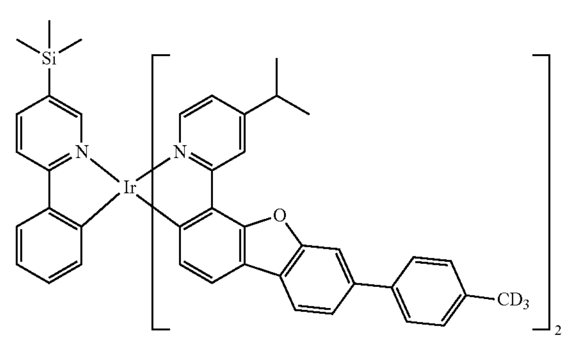

-continued
2984
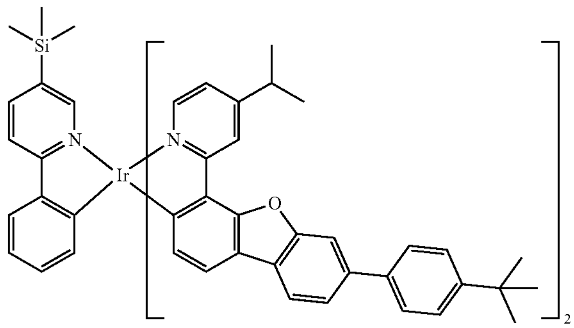
2985
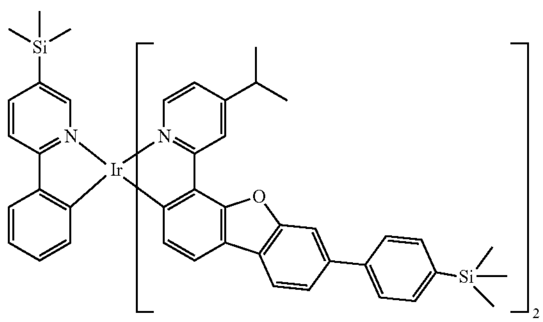
2986
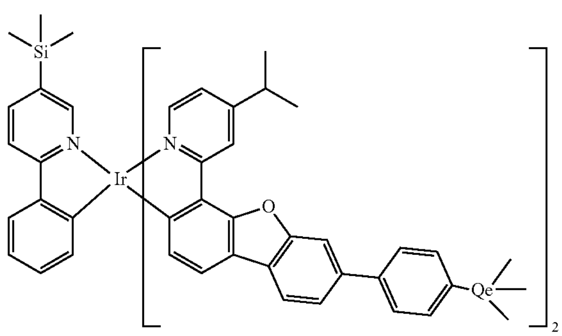
2987
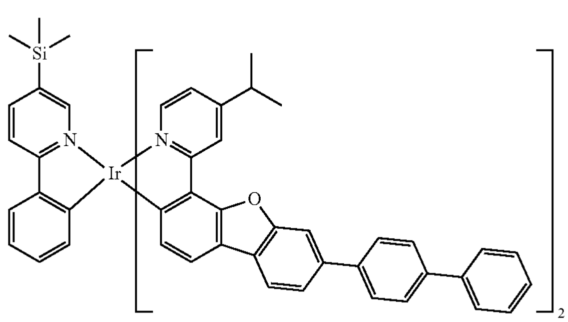
-continued
2988
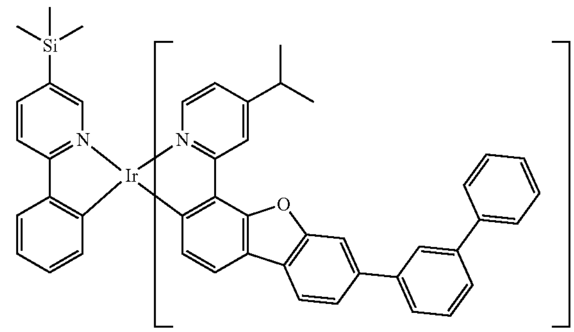
2989
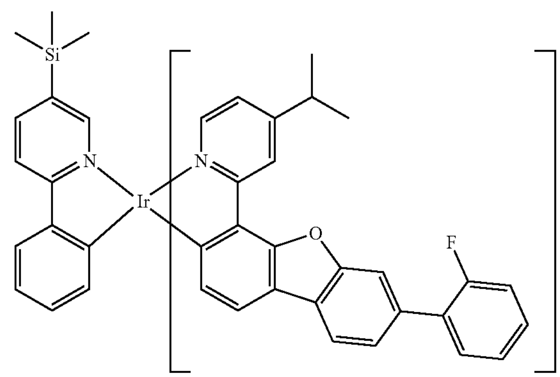
2990
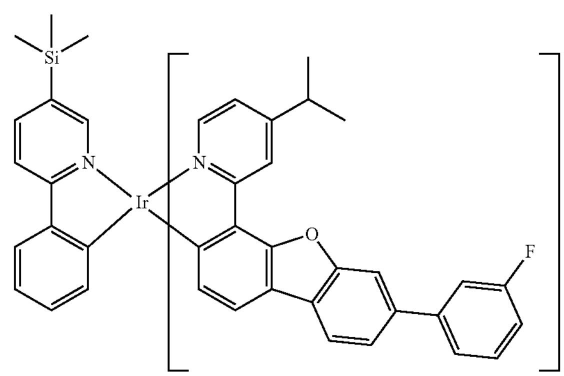
2991
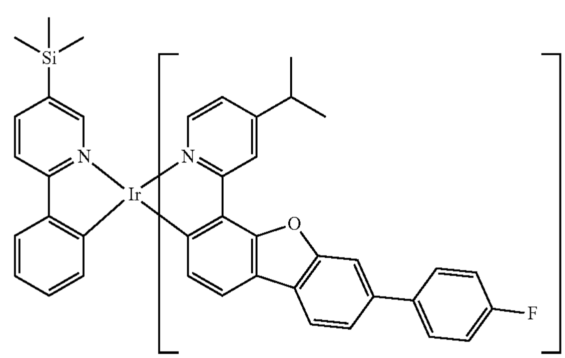

-continued
2992
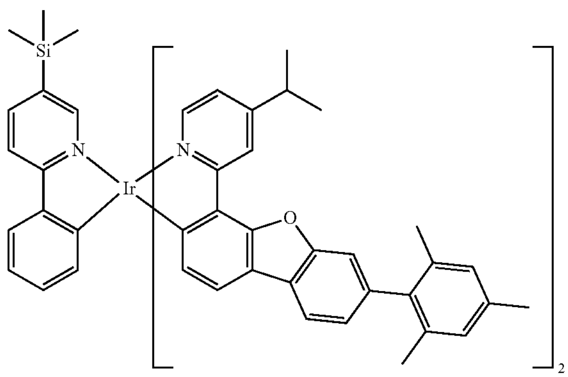
2993
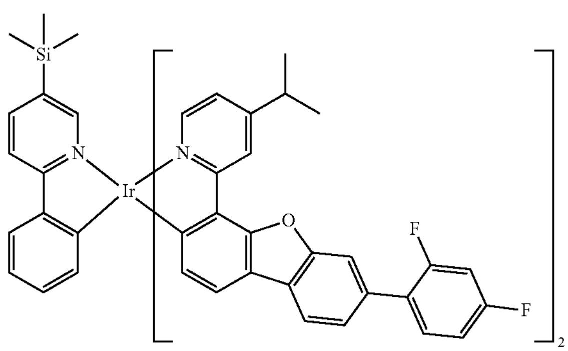
2994
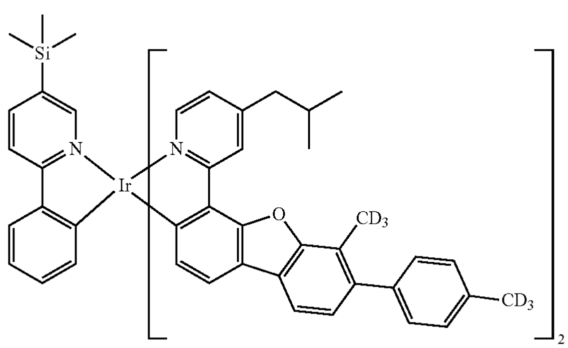
2995
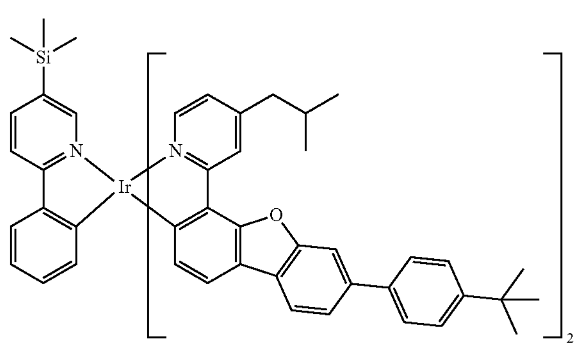
-continued
2996
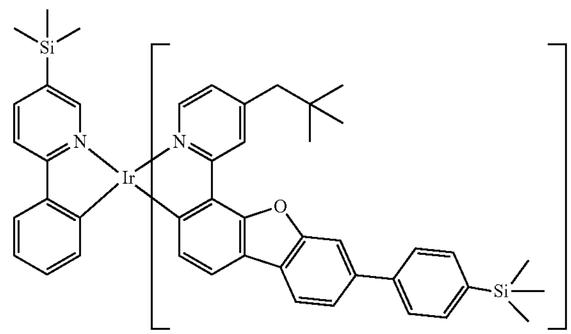
2997
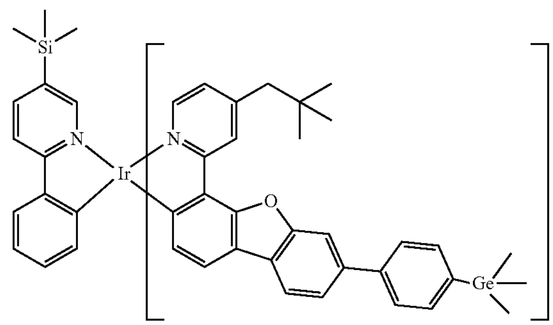
2998
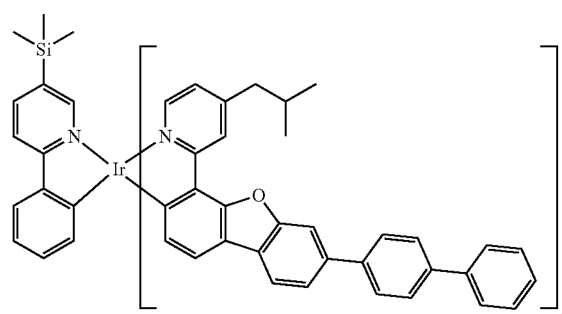
2999
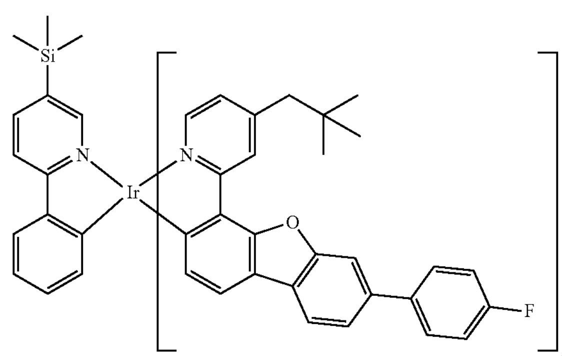

-continued
3000
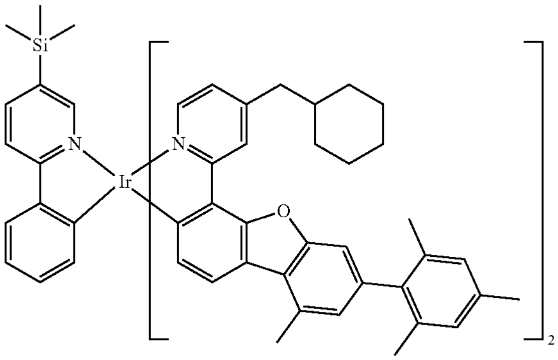
3001
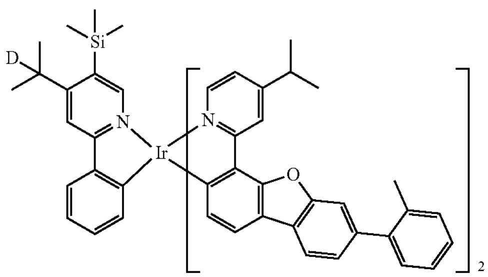
3002
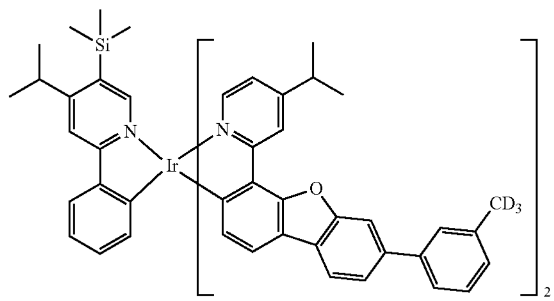
3003
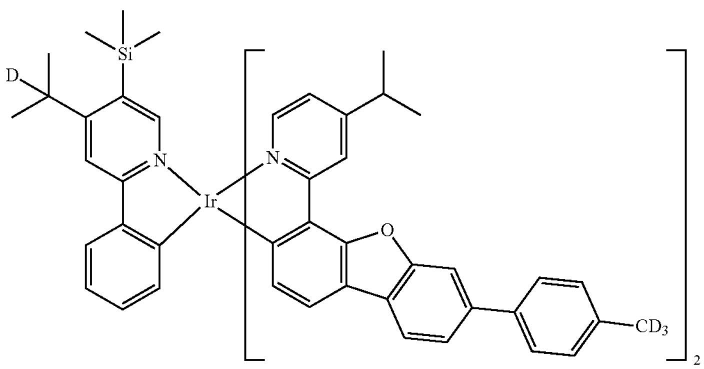
3004
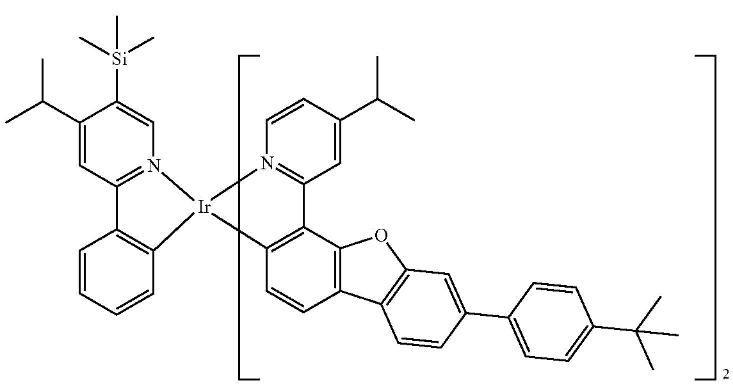

-continued
3005
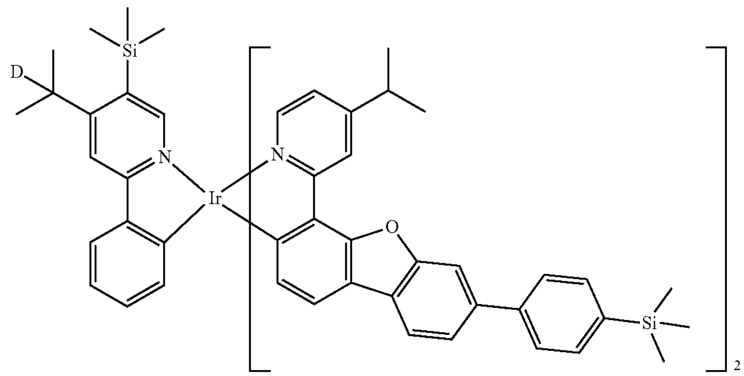
3006
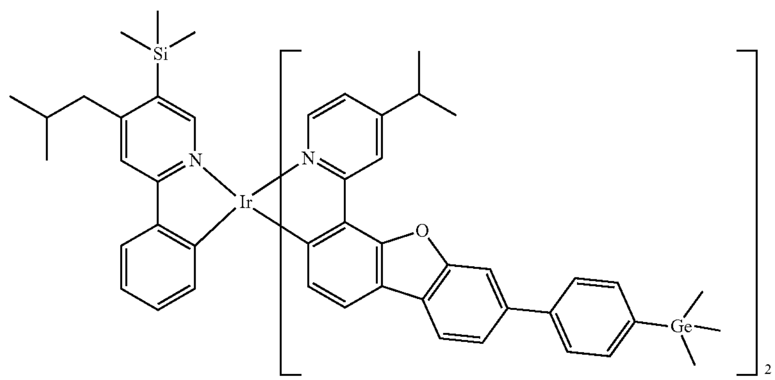
3007
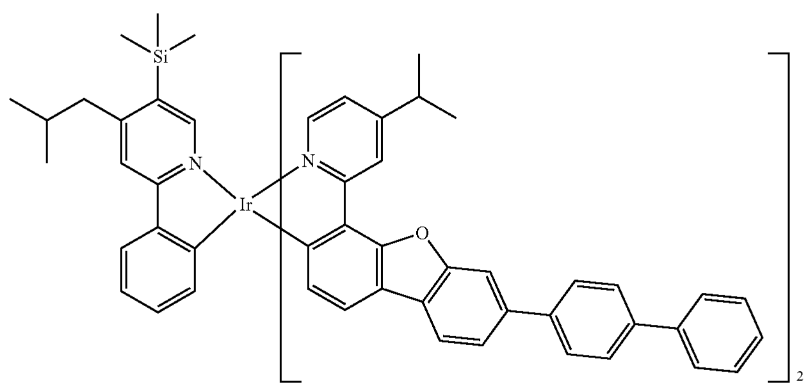
3008
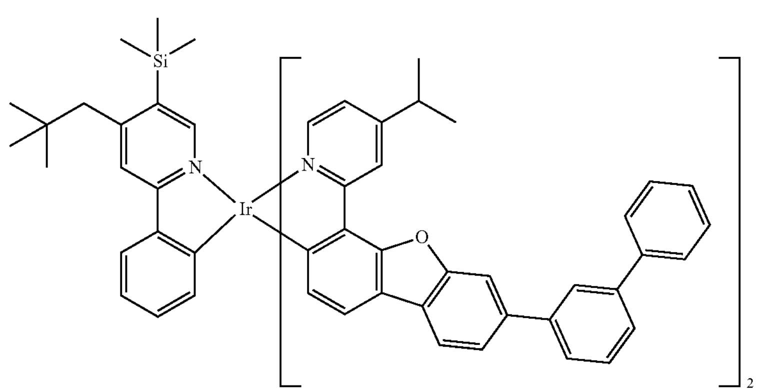

-continued
3009
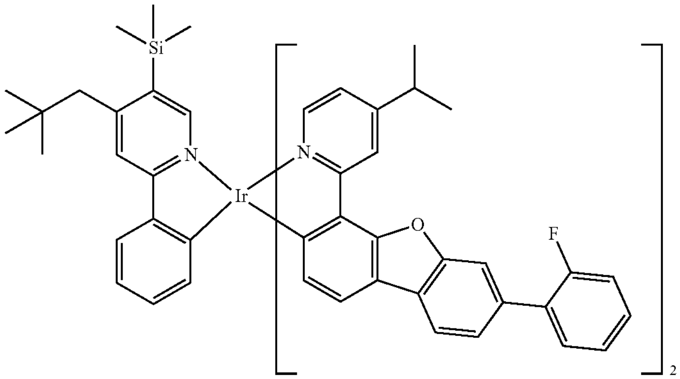
3010
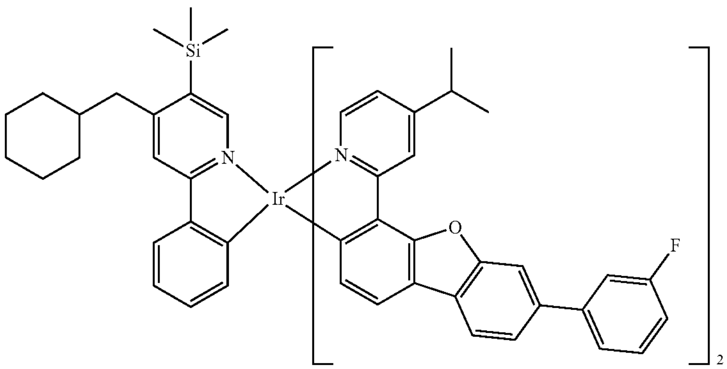
3011
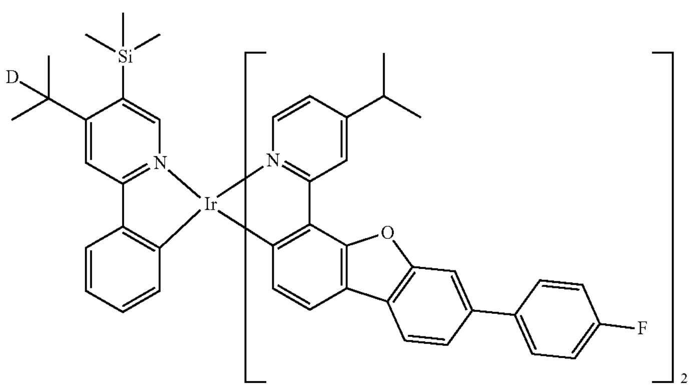
3012
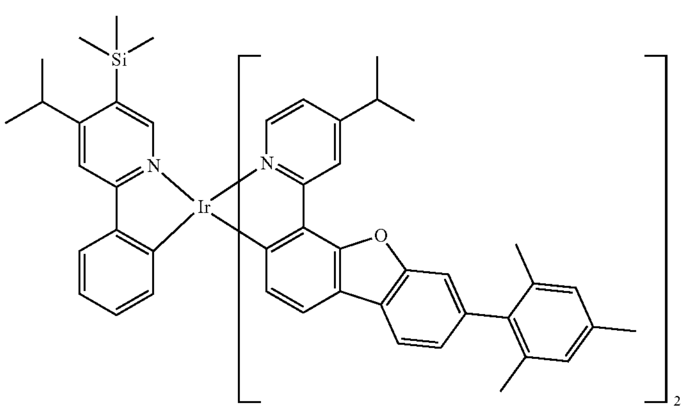

-continued
3013
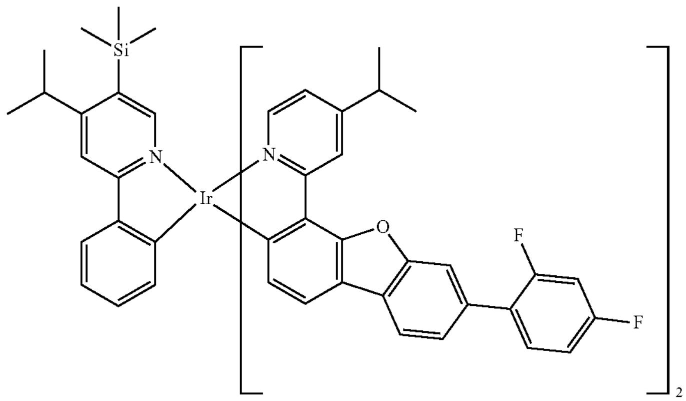
3014
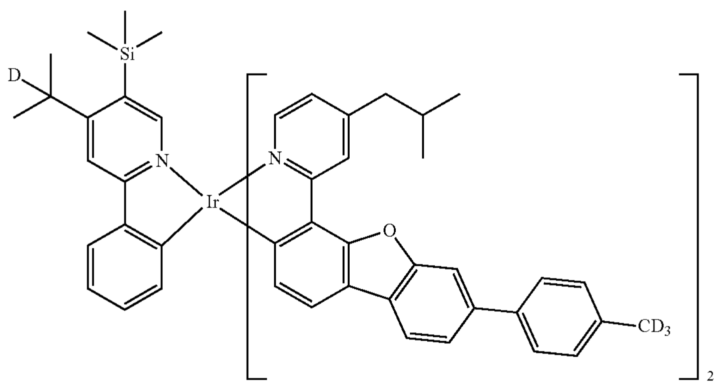
3015
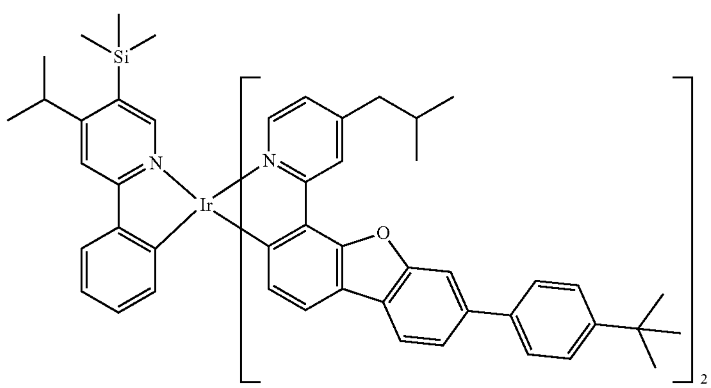
3016
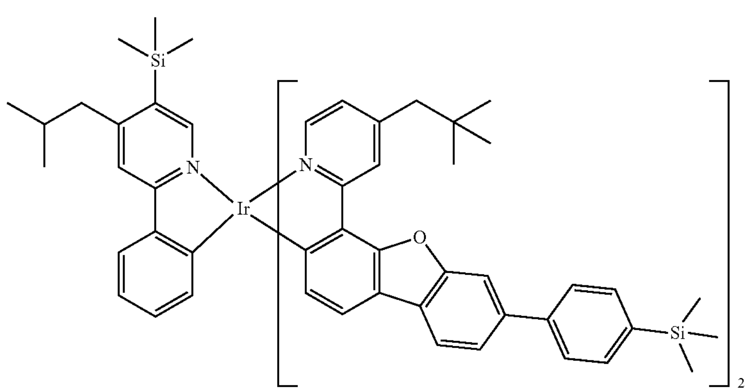

-continued
3017
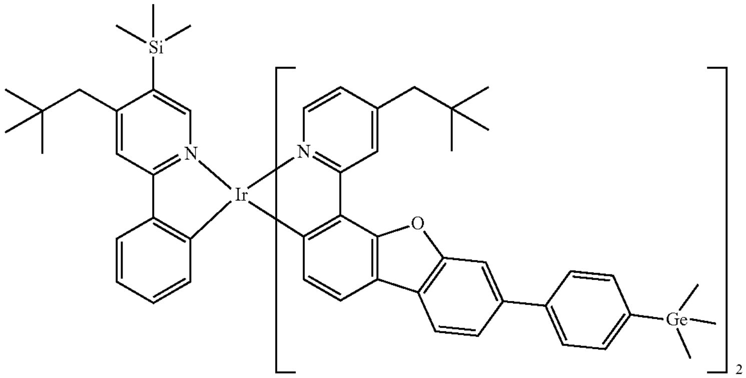
3018
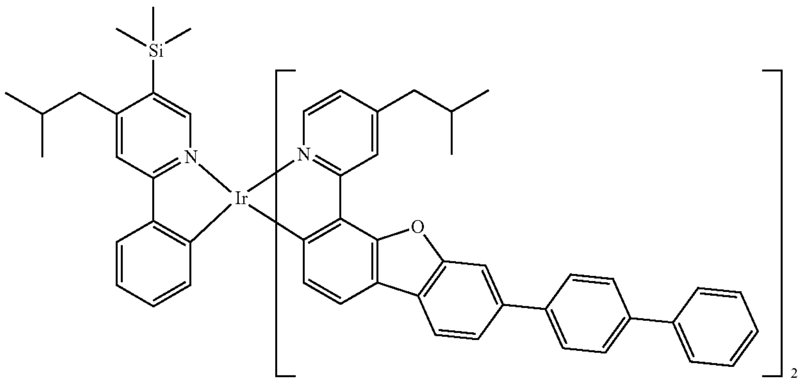
3019
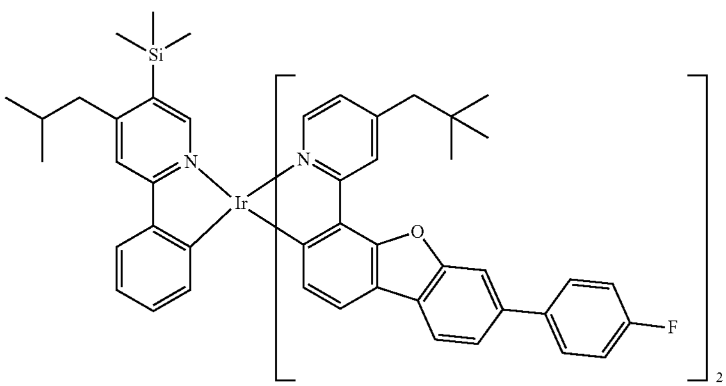
3020
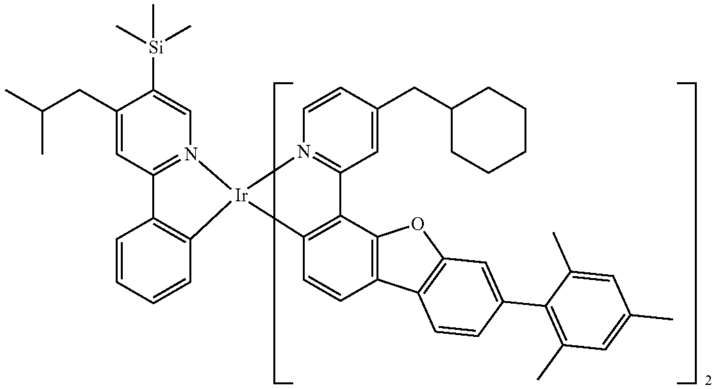

-continued
3021
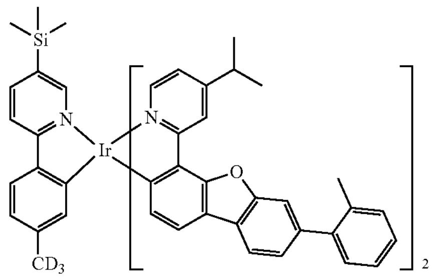
3022
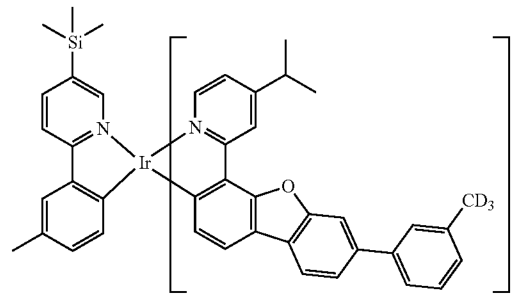
3023
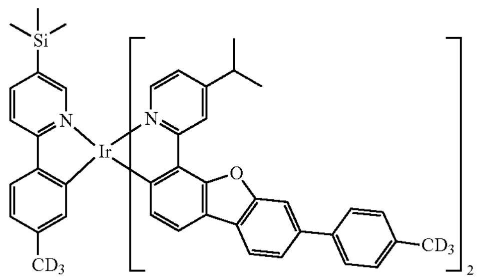
3024
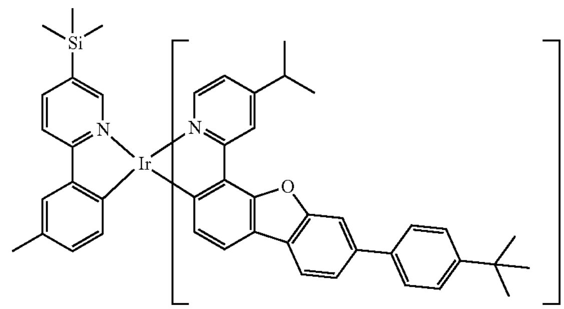
3025
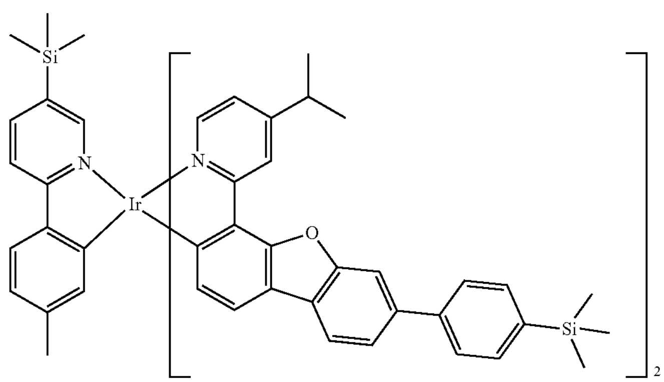
3026
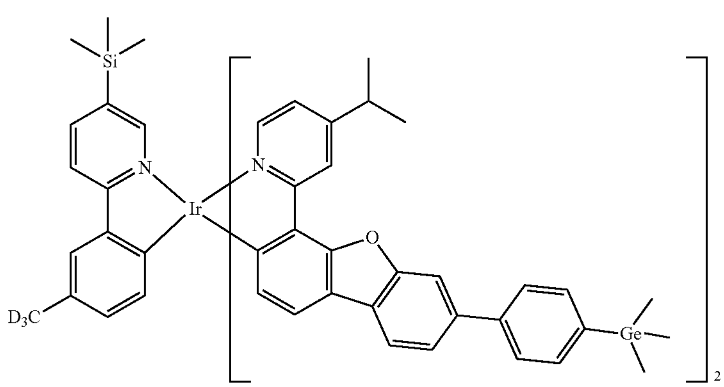

-continued
3027
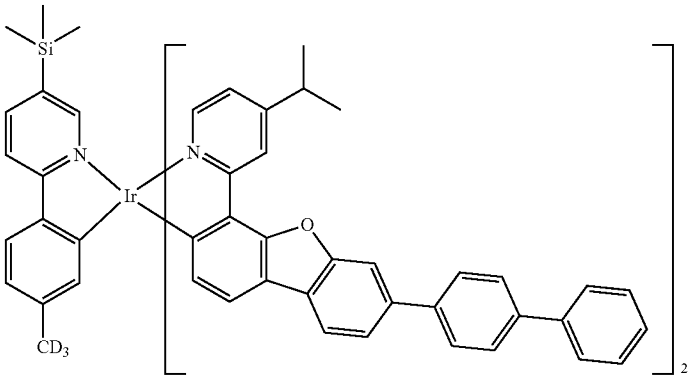
3028
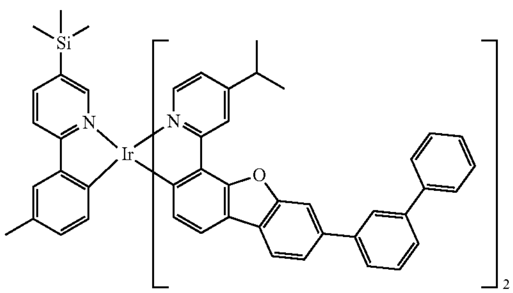
3029
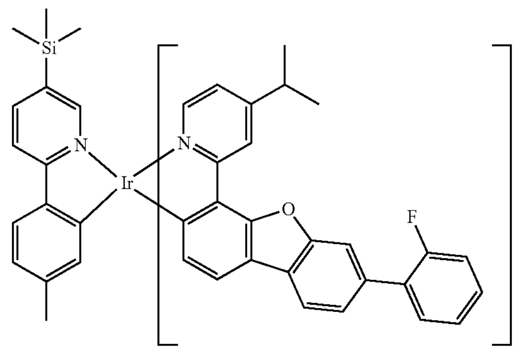
3030
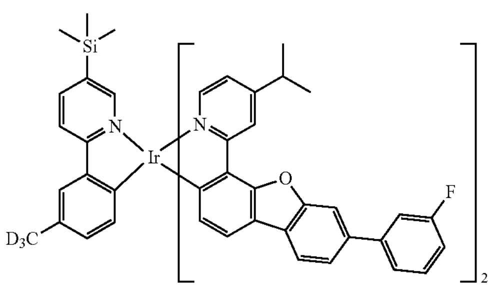
3031
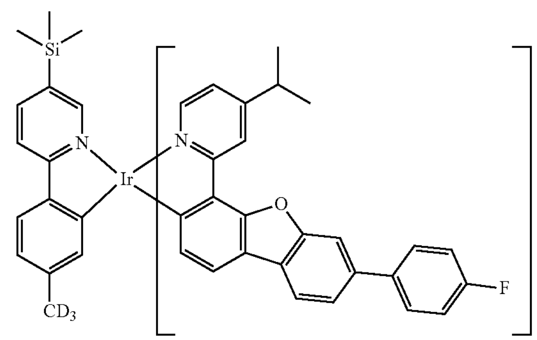
3032
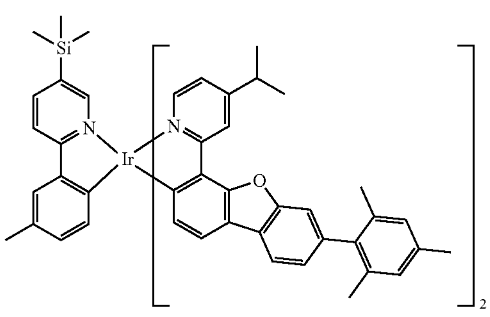
3033
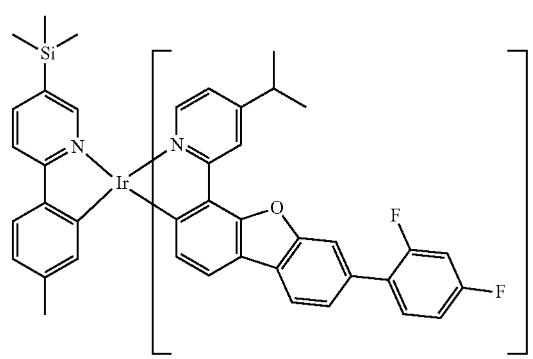

-continued
3034
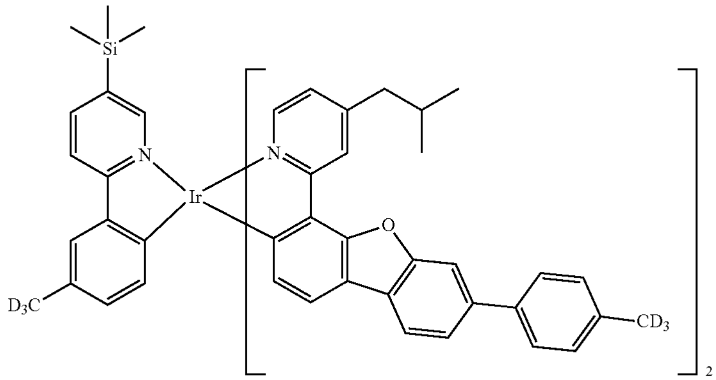
3035
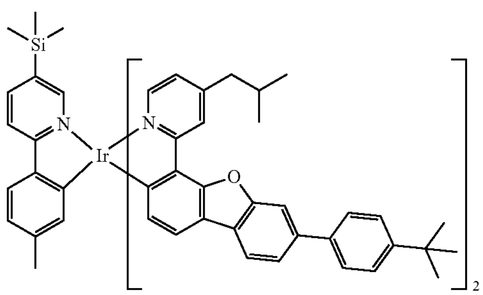
3036
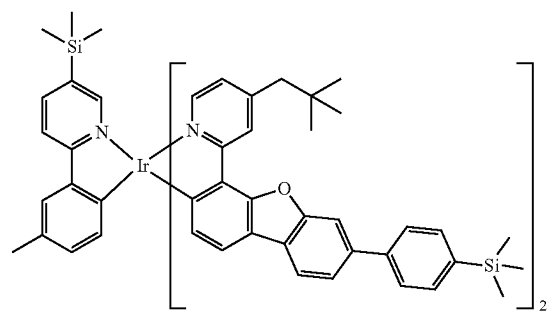
3037
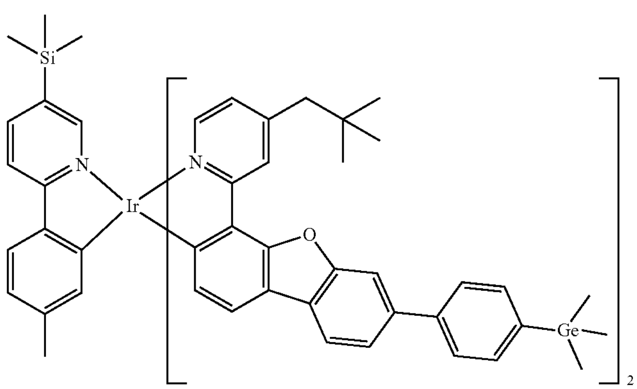
3038
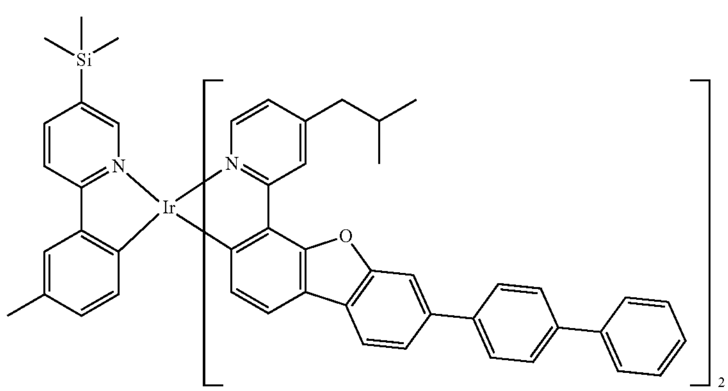

-continued
3039
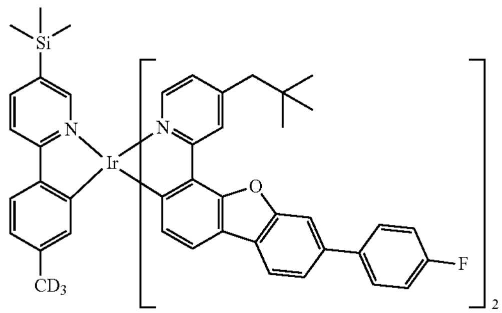
3040
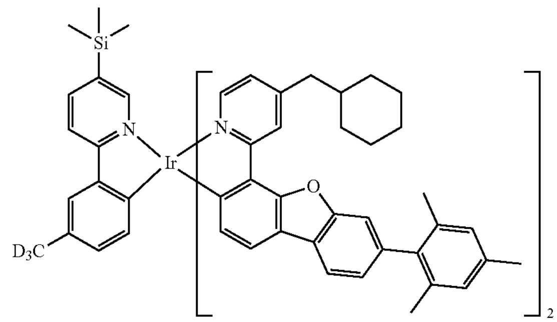
3041
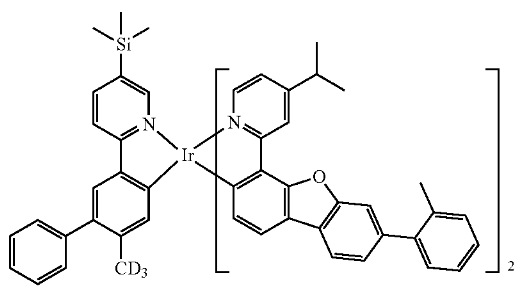
3042
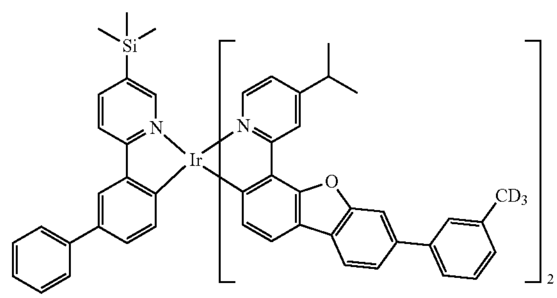
3043
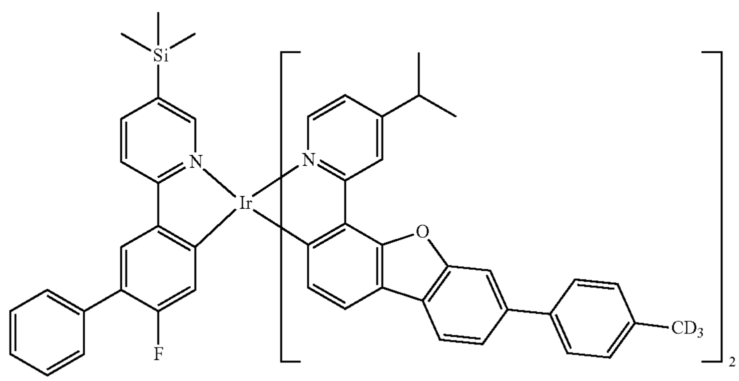
3044
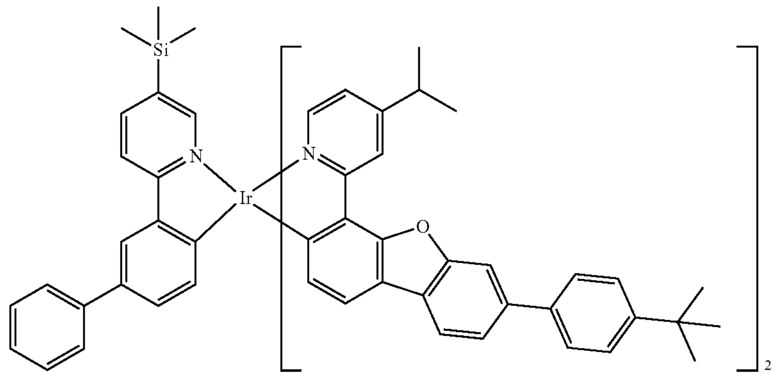

-continued
3045
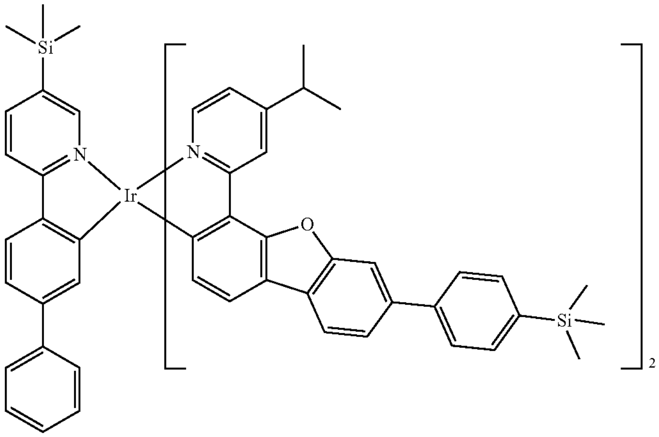
3046
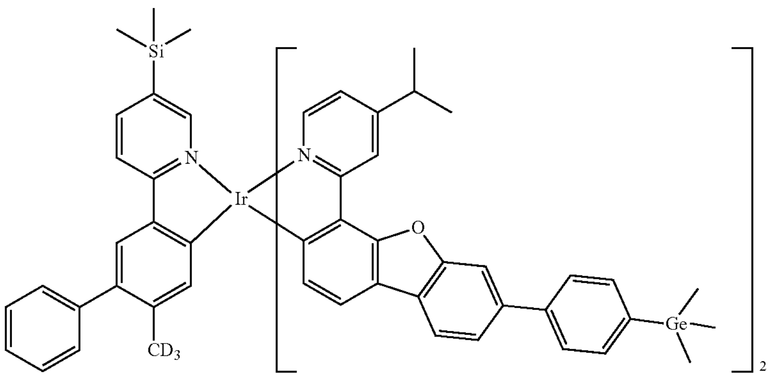
3047
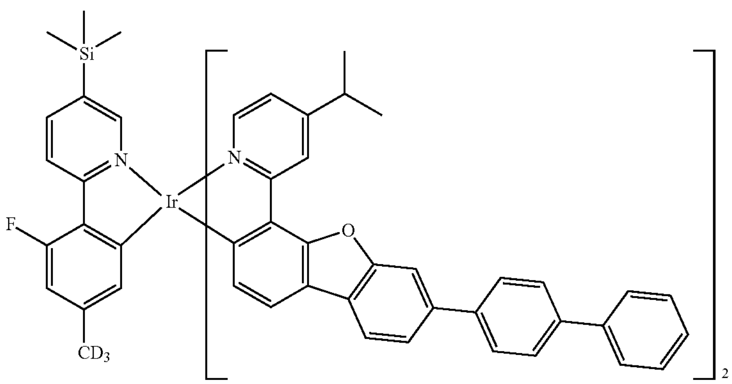
3048
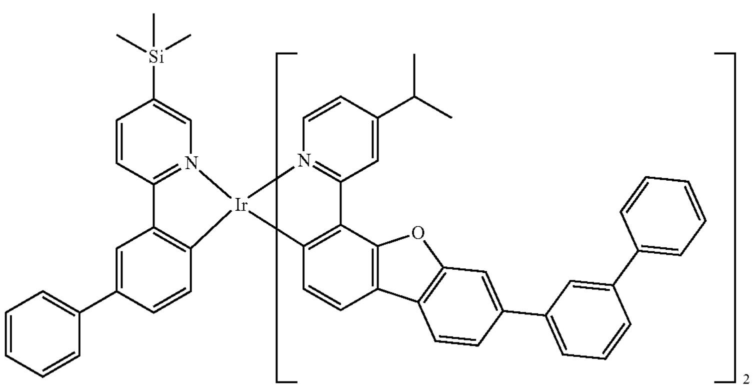

-continued
3049
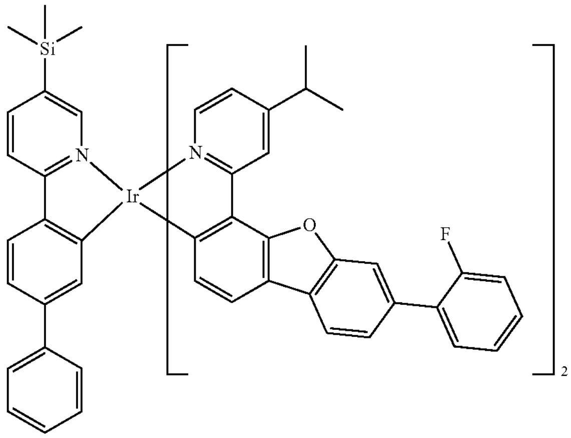
3050
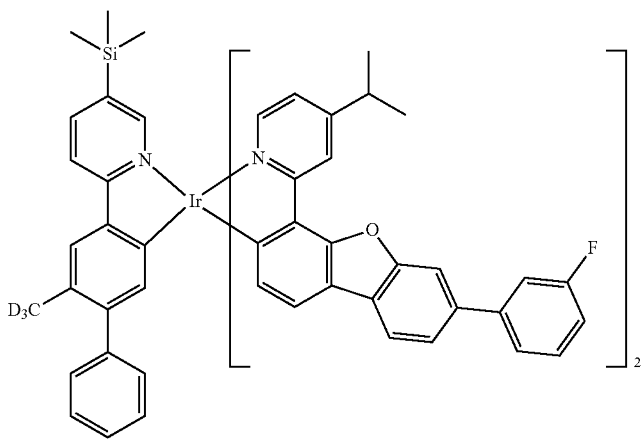
3051
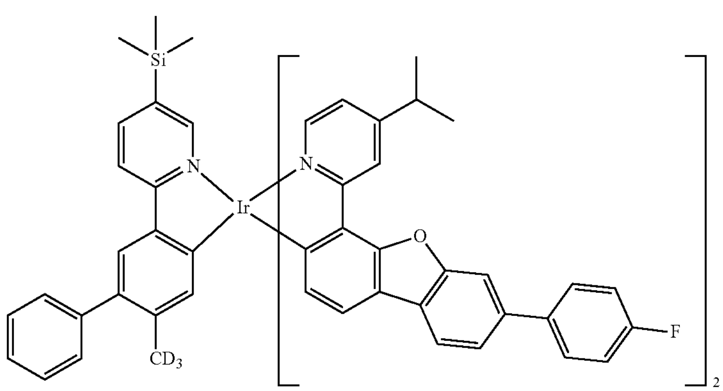

-continued
352
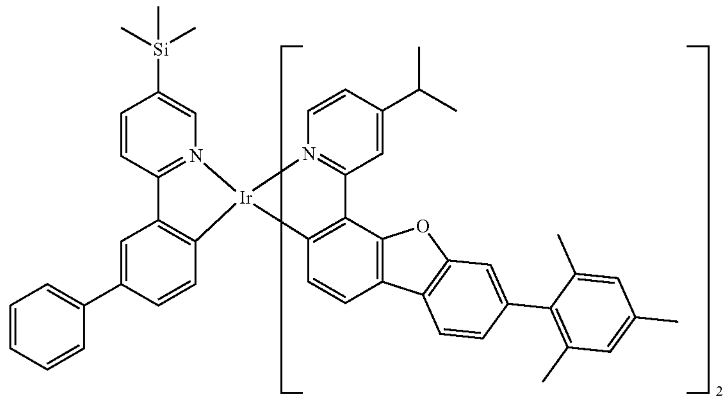
3053
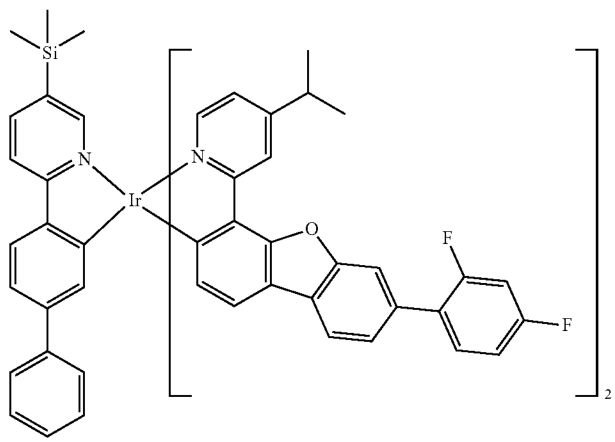
3054
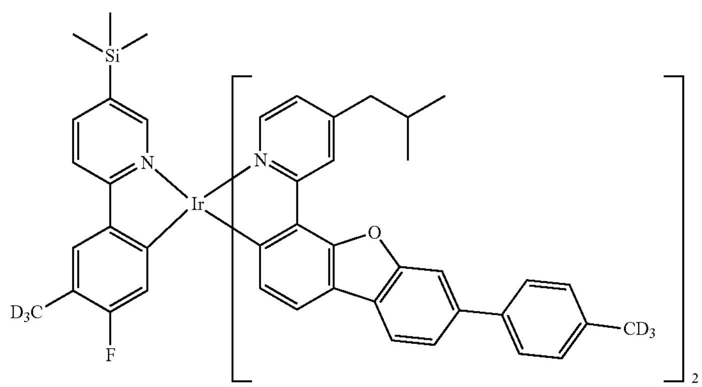
3055
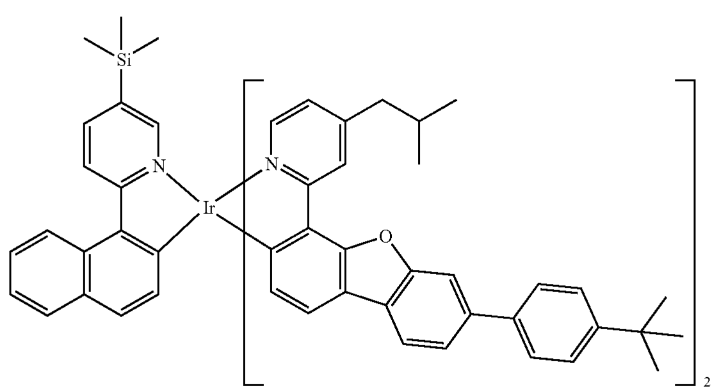

-continued
3056
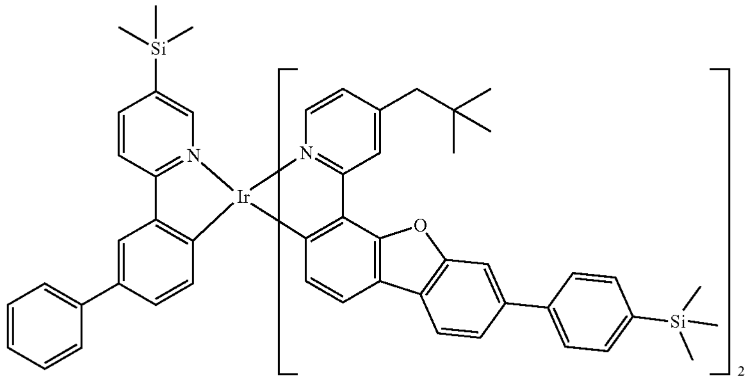
3057
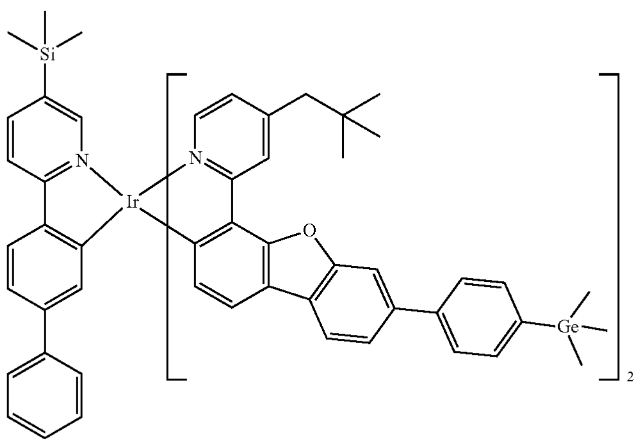
3058
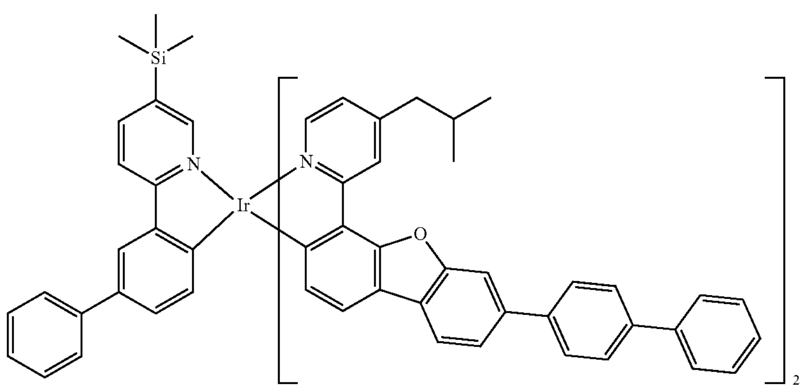
3059
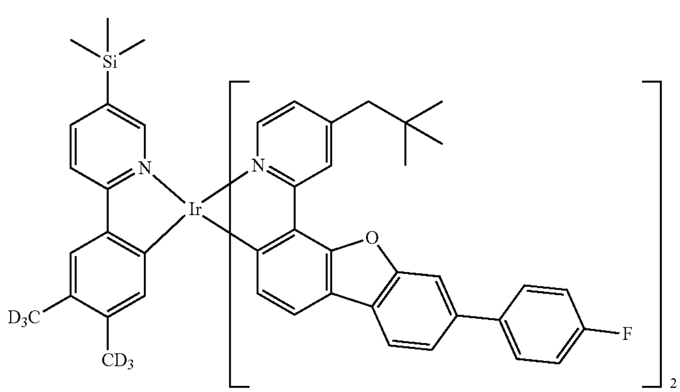

-continued
3060
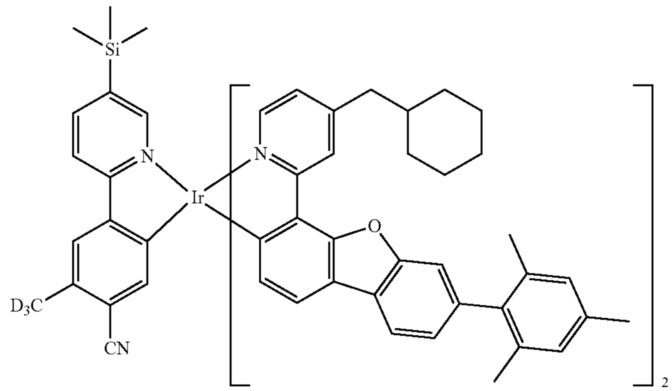
3061
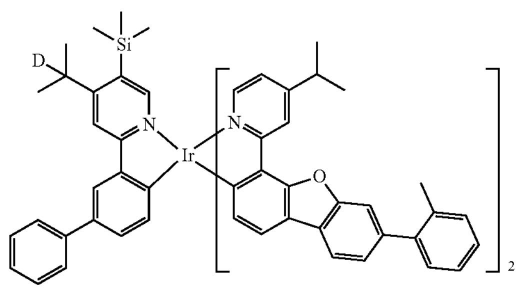
3062
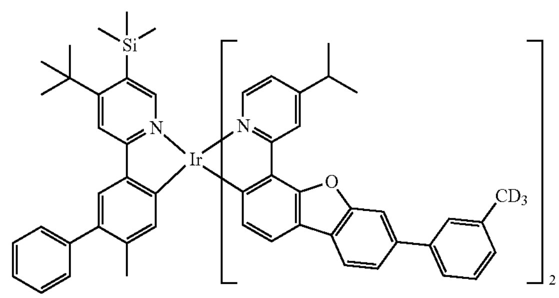
3063
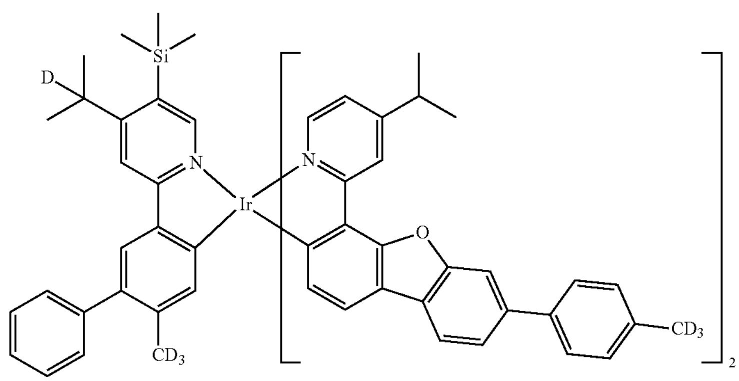
3064
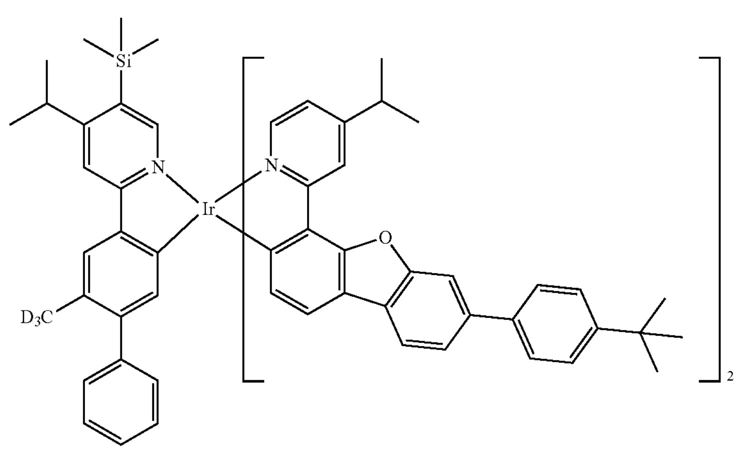

-continued
3065
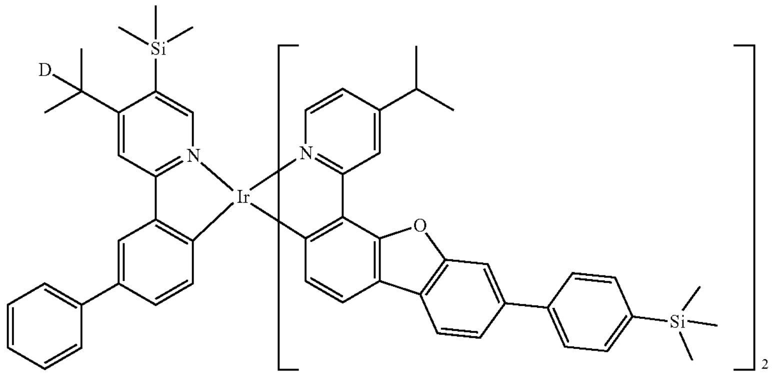
3066
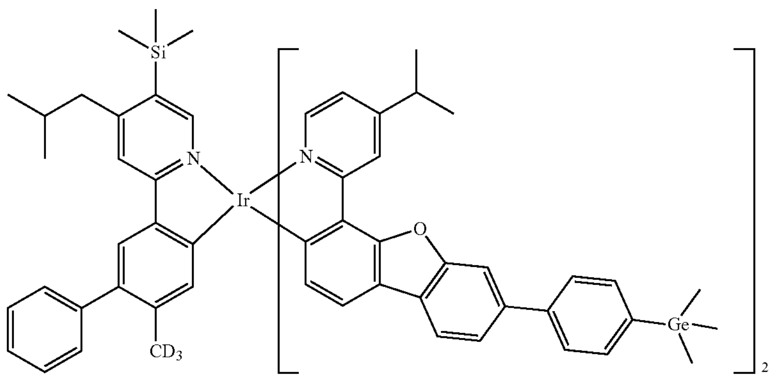
3067
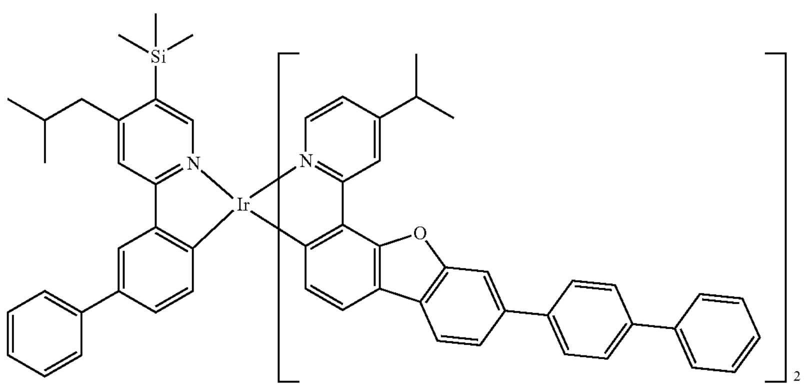
3068
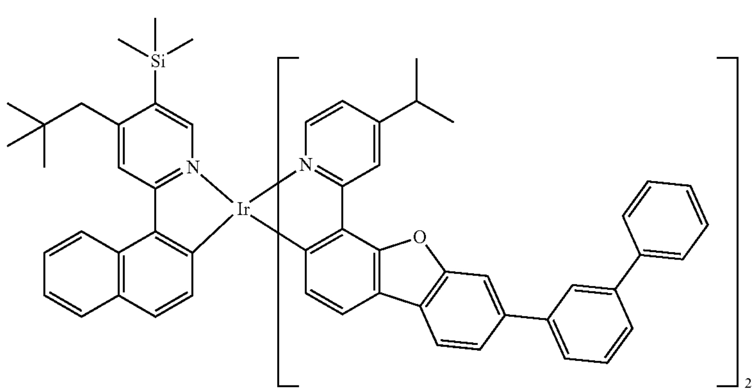

-continued
3069
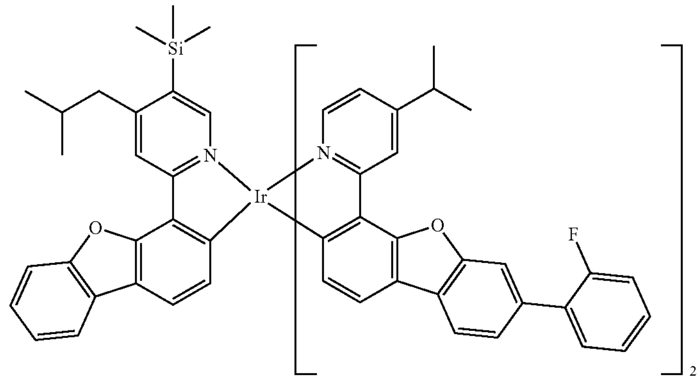
3070
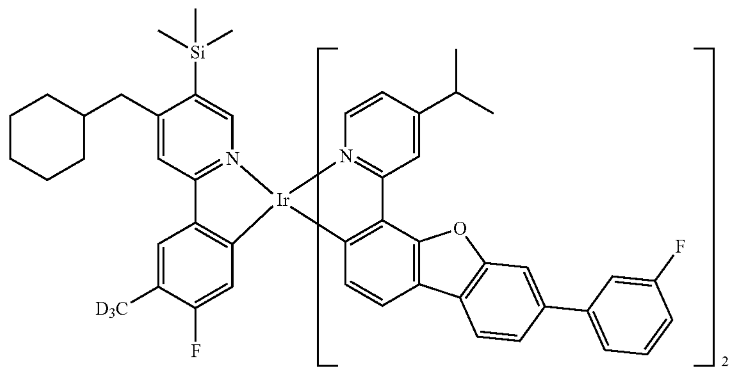
3071
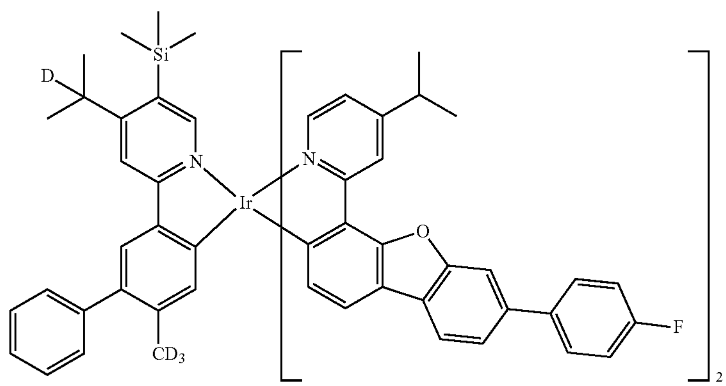
3072
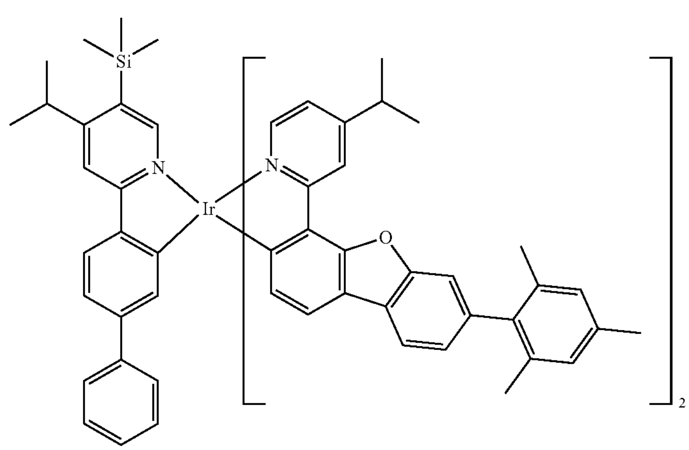

-continued
3073
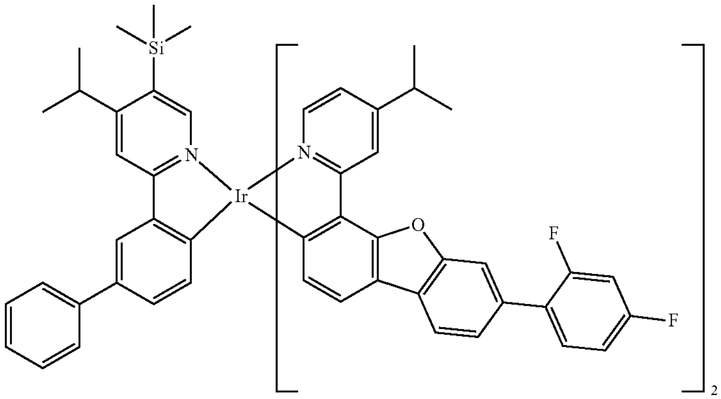
3074
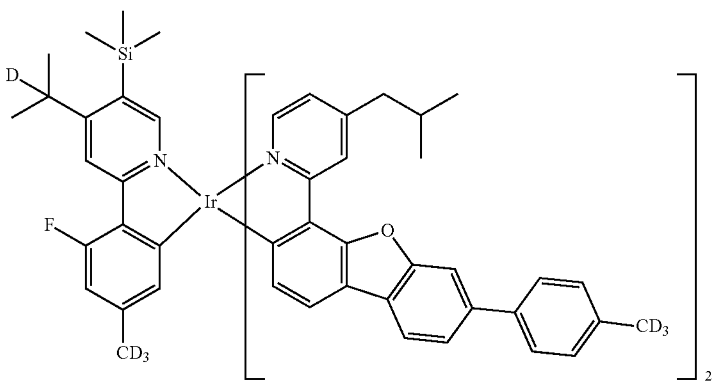
3075
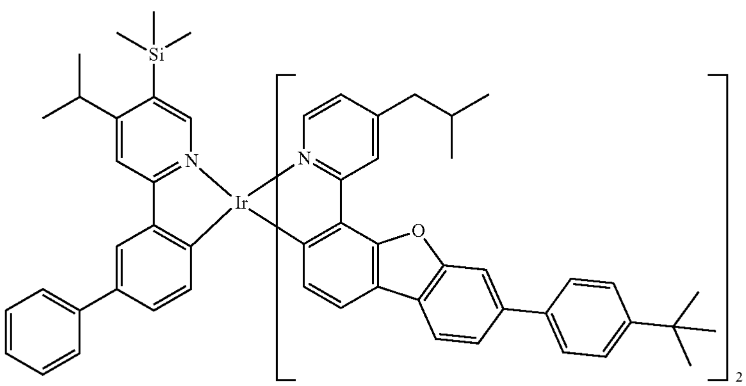
3076
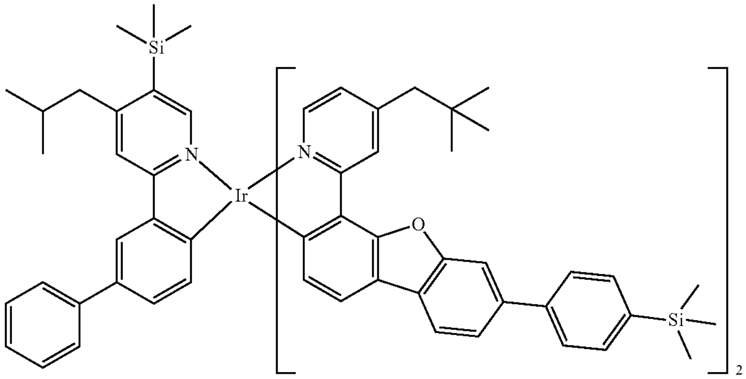

-continued
3077
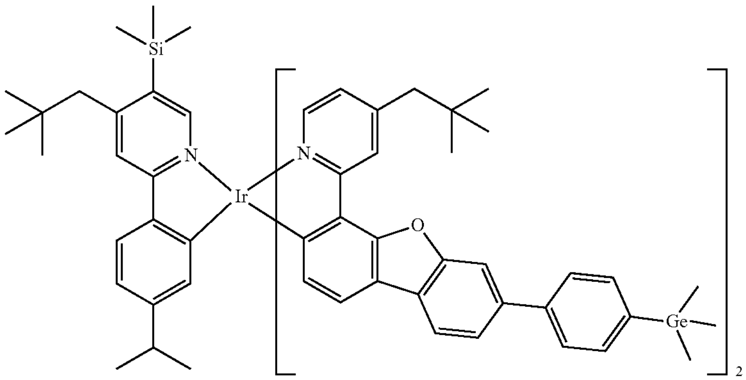
3078
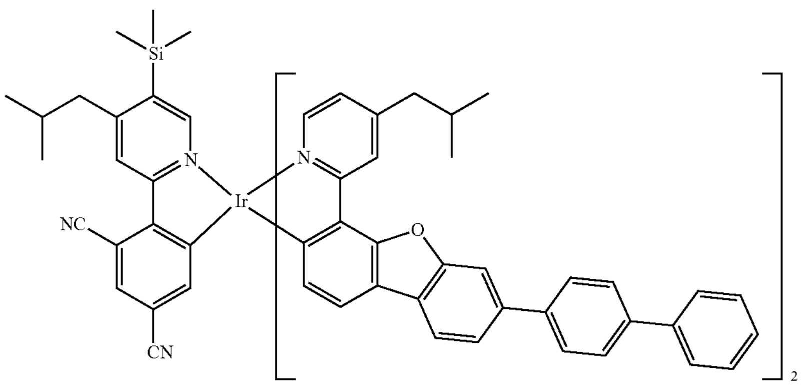
3079
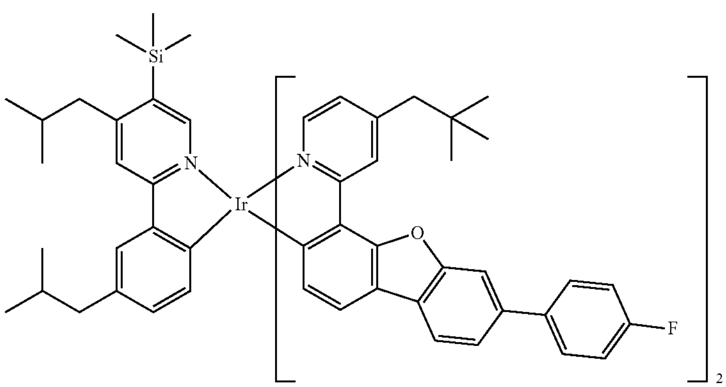
3080
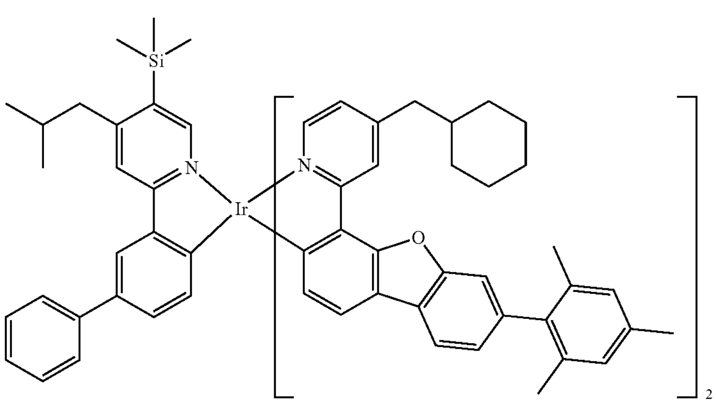

-continued
3081
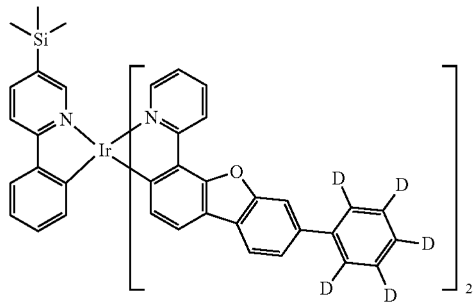
3082
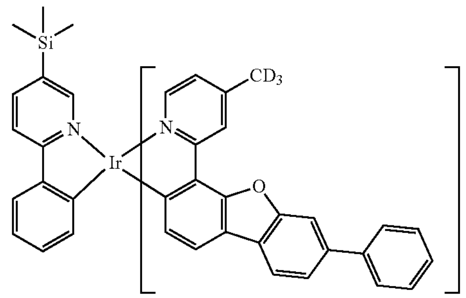
3083
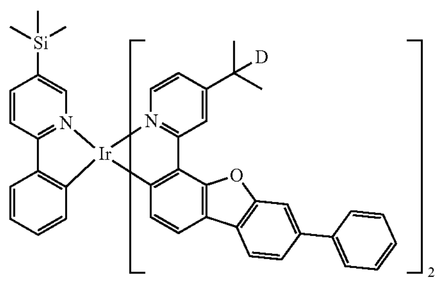
3084
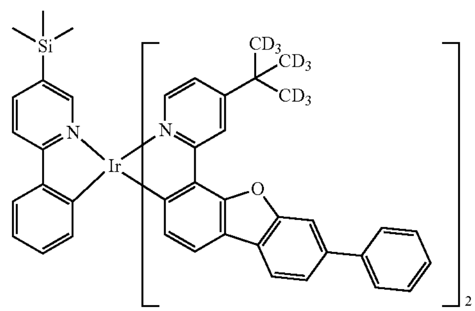
3085
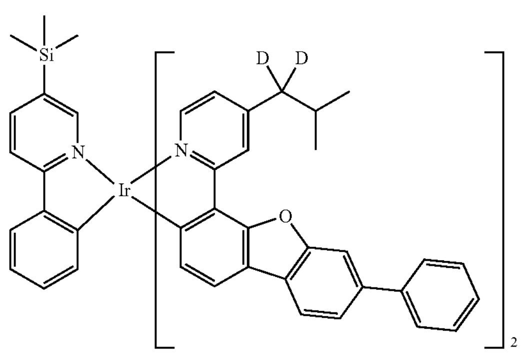
3086
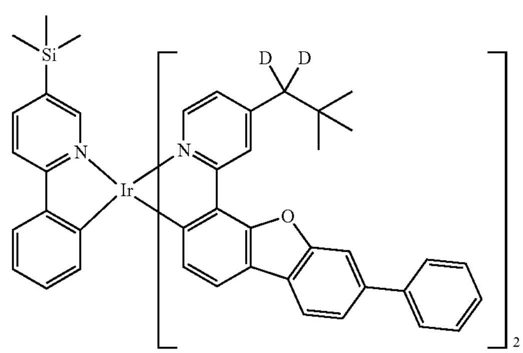
3087
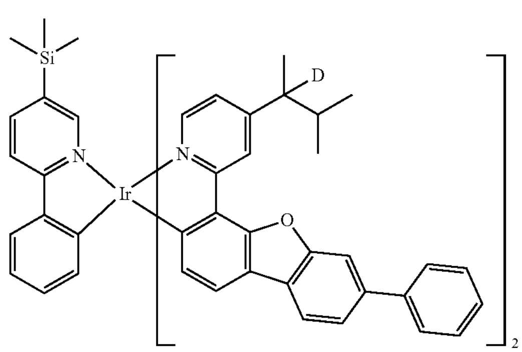
3088
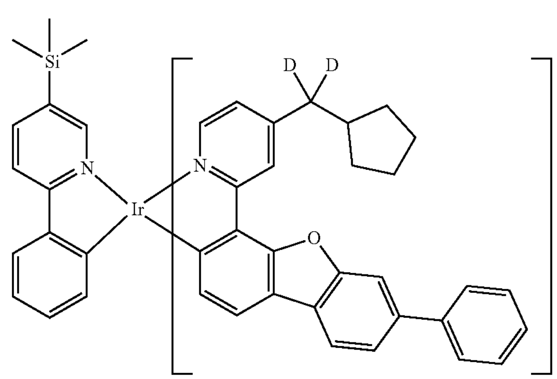

-continued
3089
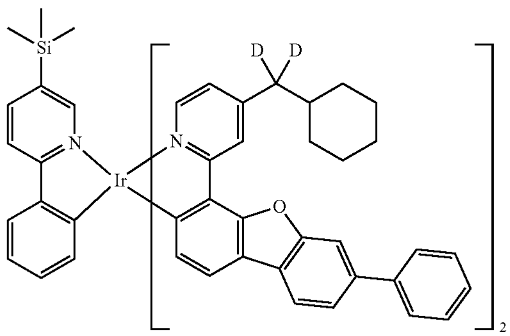
3090
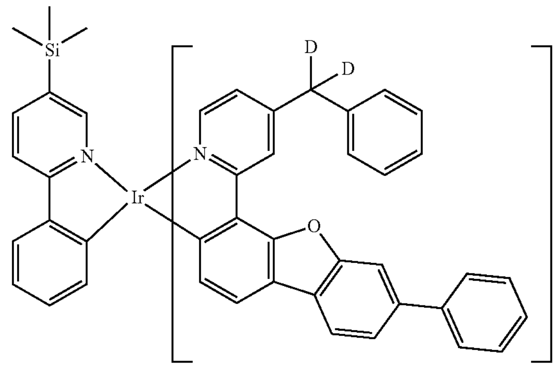
3091
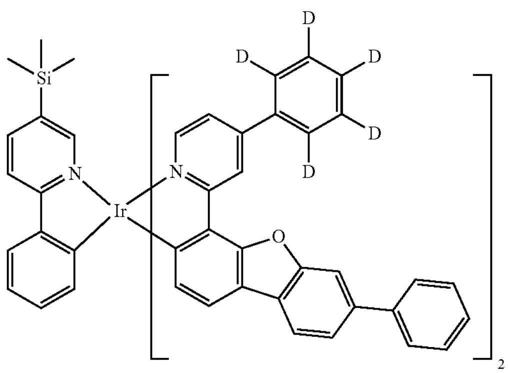
3092
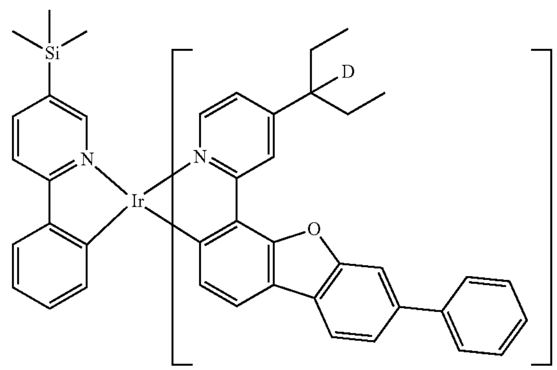
3093
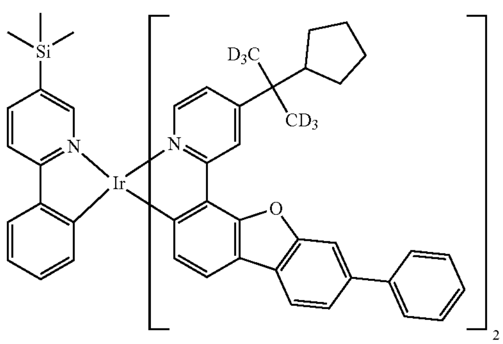
3094
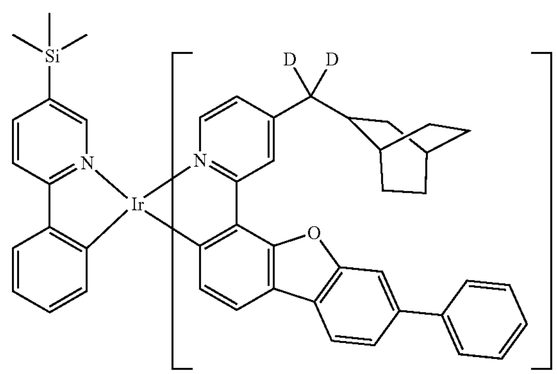
3095
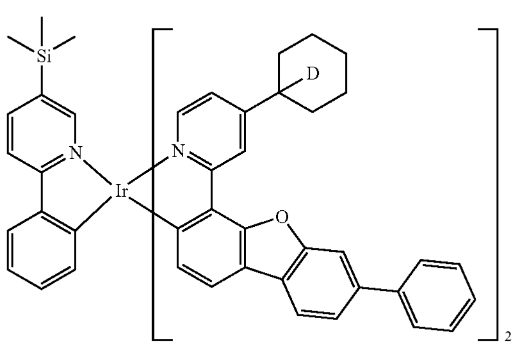
3096
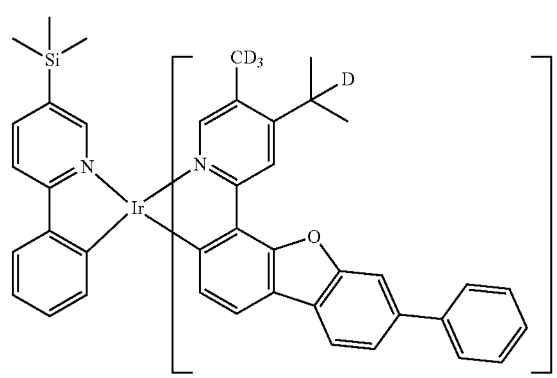

-continued
3097
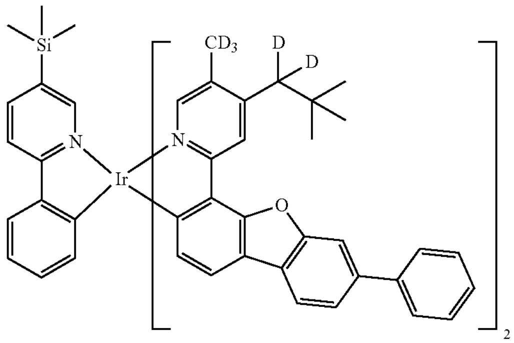
3098
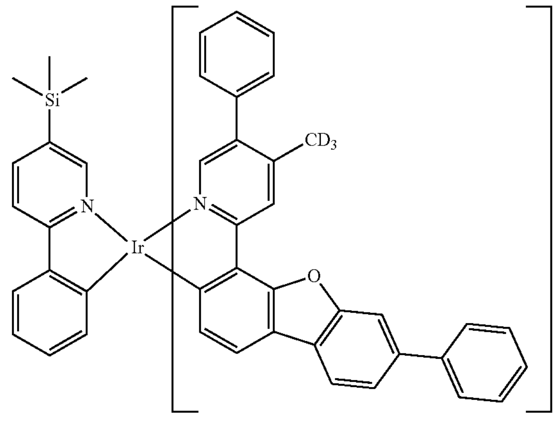
3099
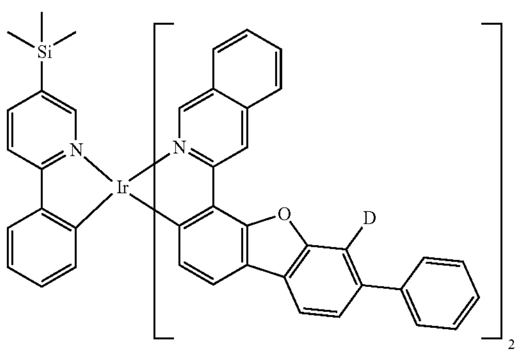
3100
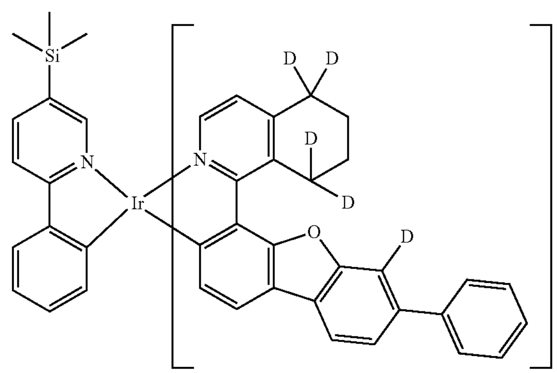
3101
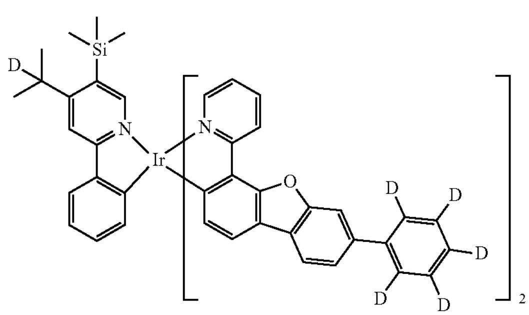
3102
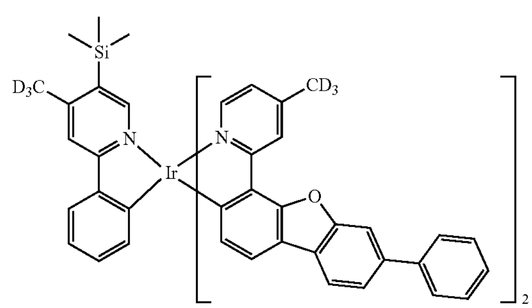
3103
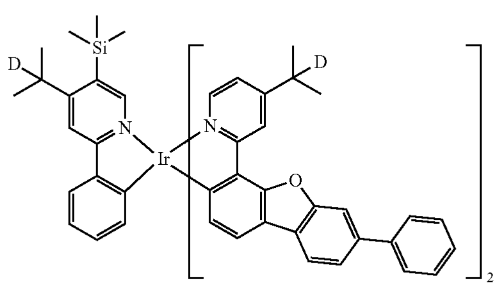
3104
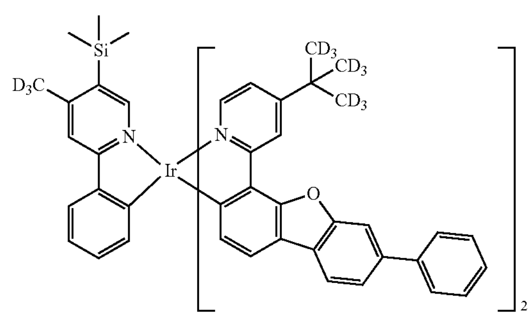

-continued
3105
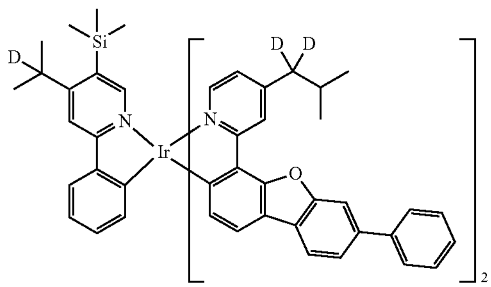
3106
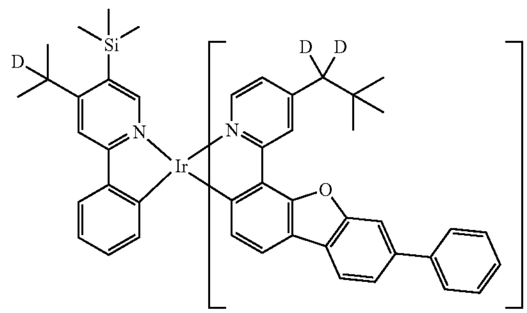
3107
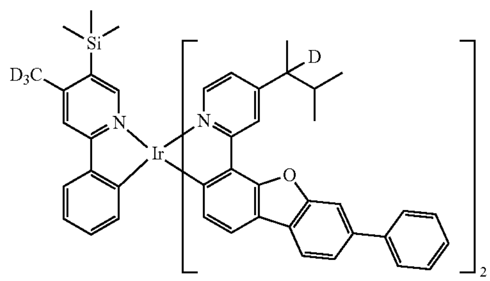
3108
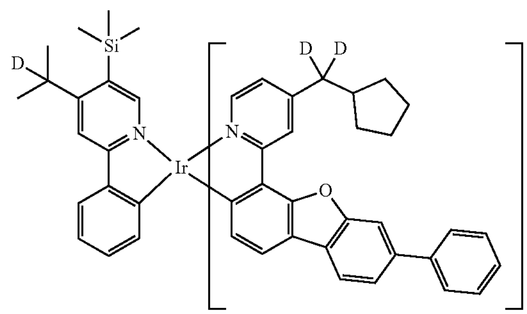
3109
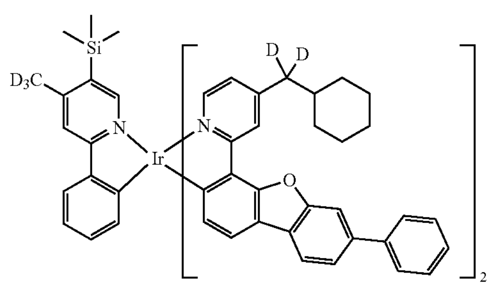
3110
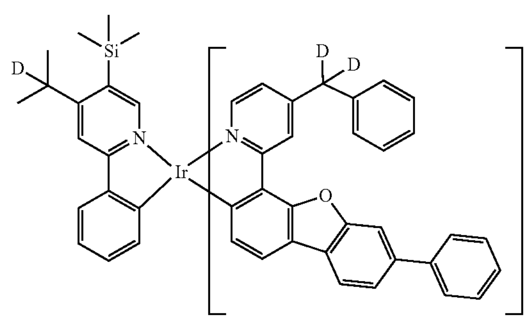
3111
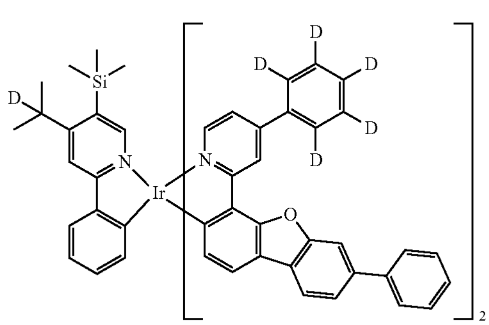
3112
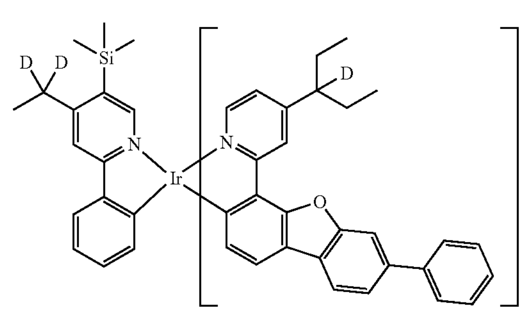

-continued
3113
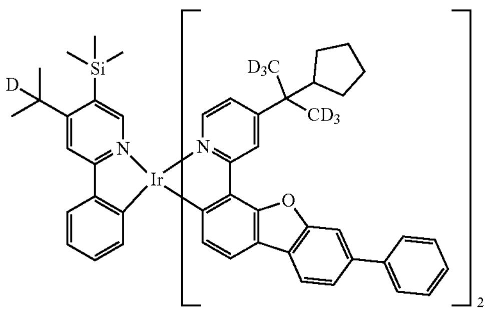
3114
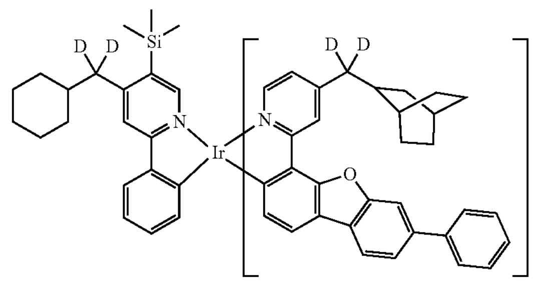
3115
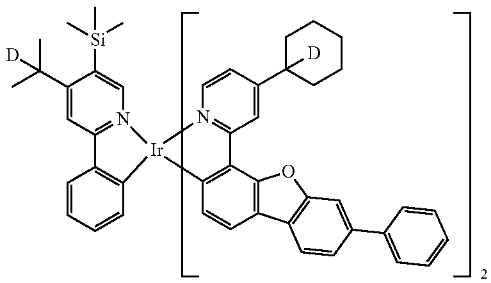
3116
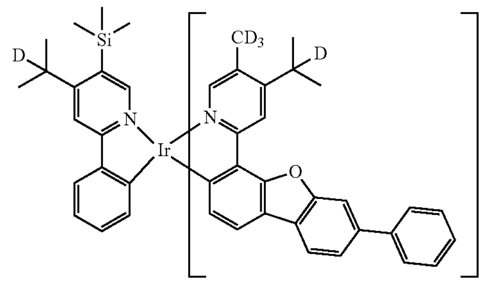
3117
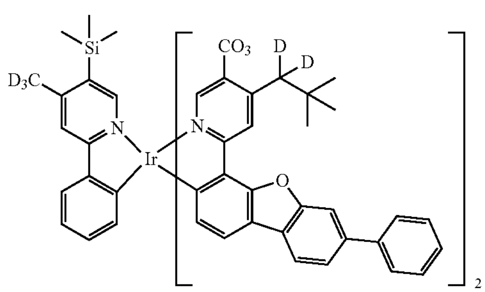
3118
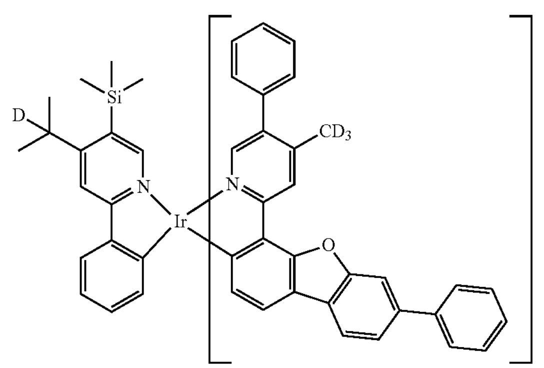
3119
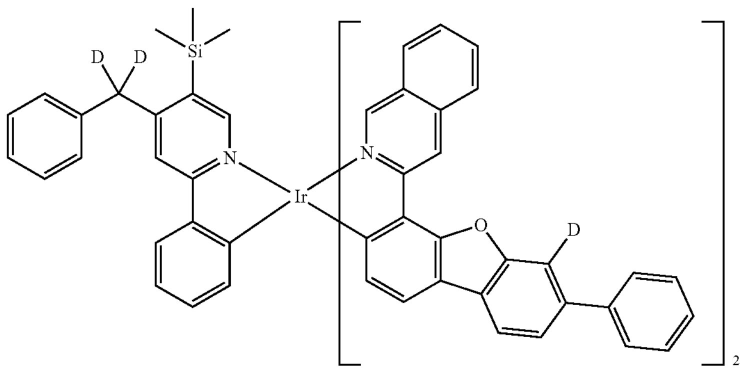

-continued
3120
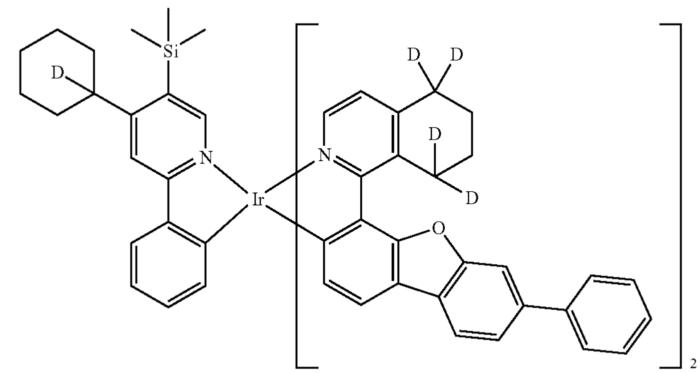
3121
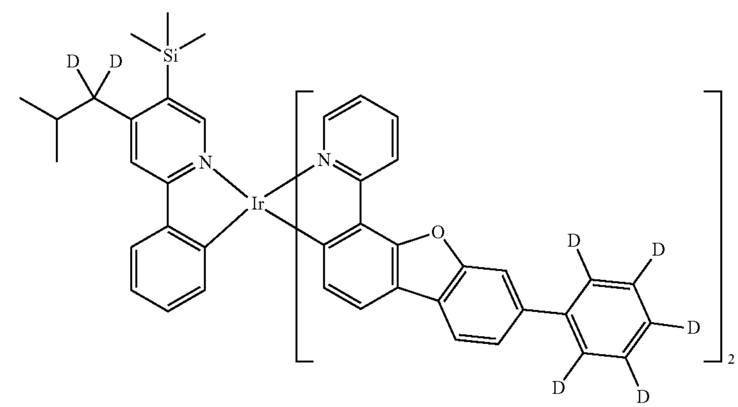
3122
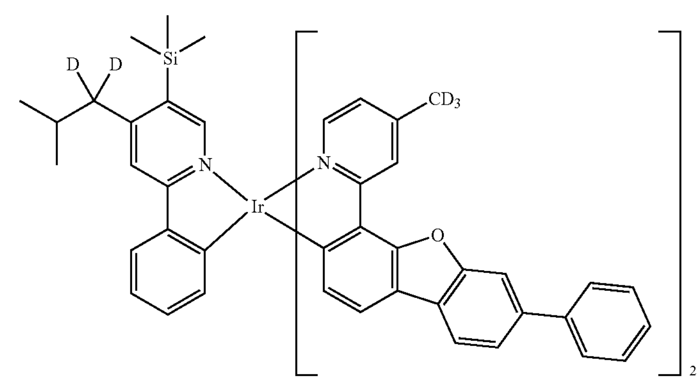
3123
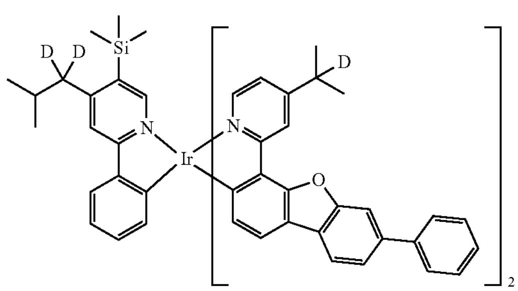
3124
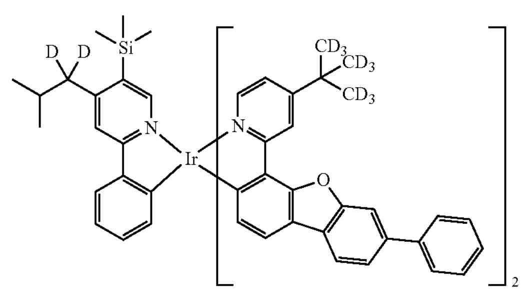

-continued
3125
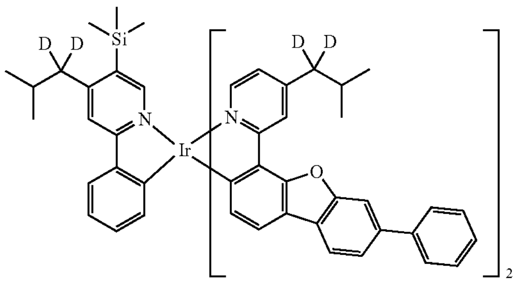
3126
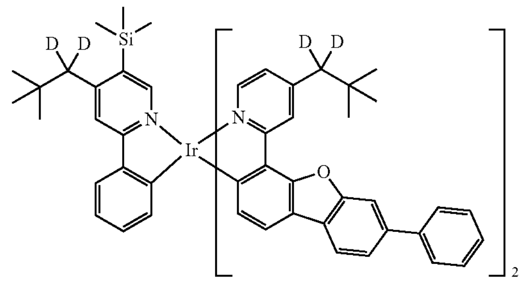
3127
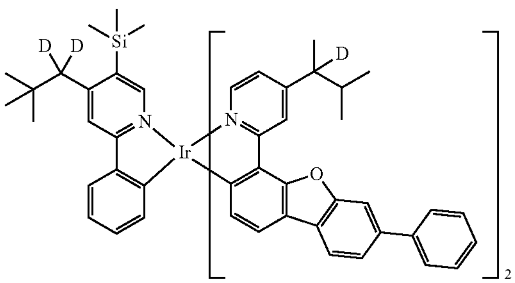
3128
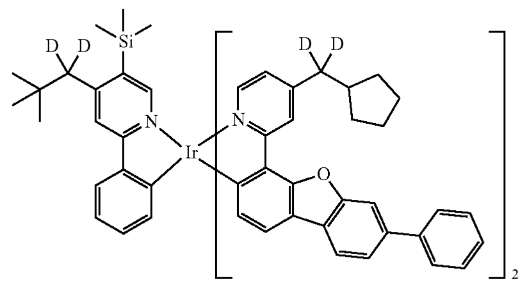
3129
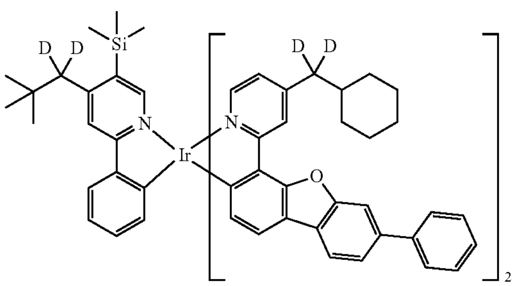
3130
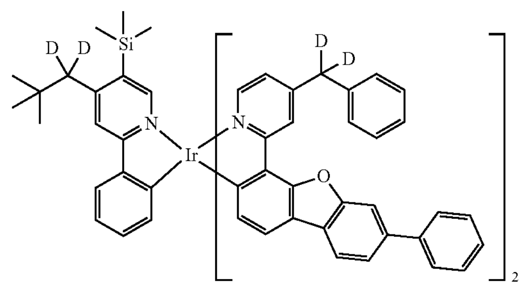
3131
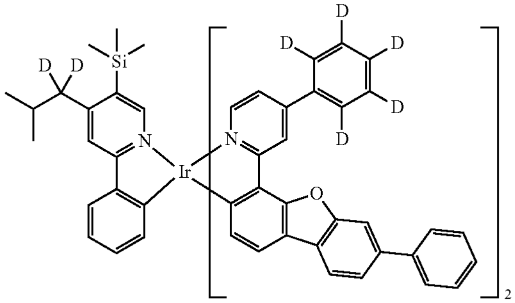
3132
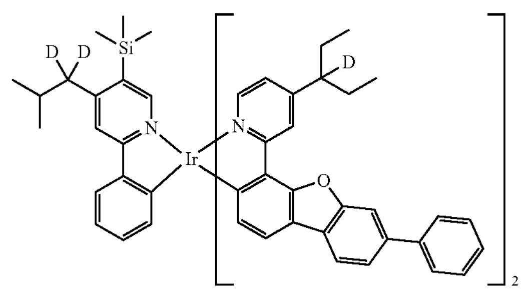
3133
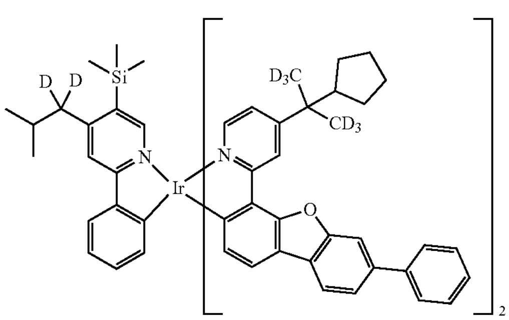
3134
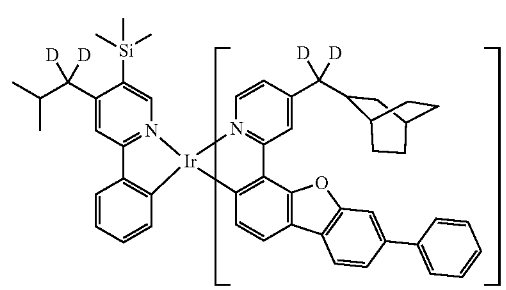

-continued
3135
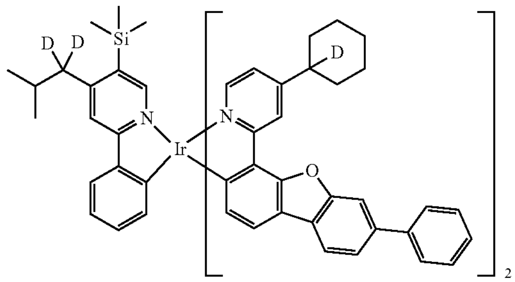
3136
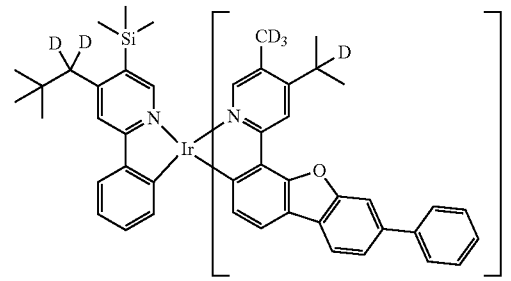
3137
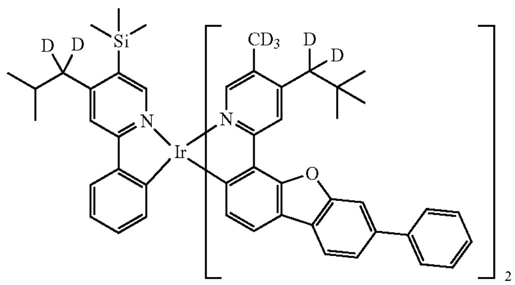
3138
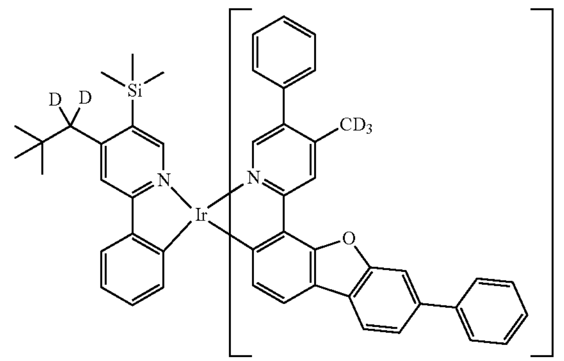
3139
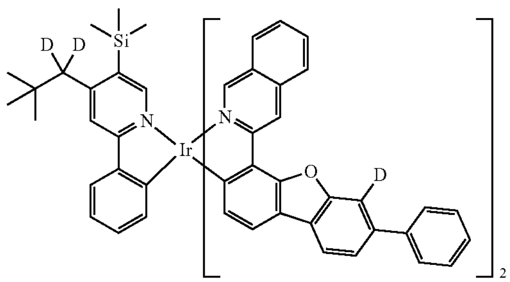
3140
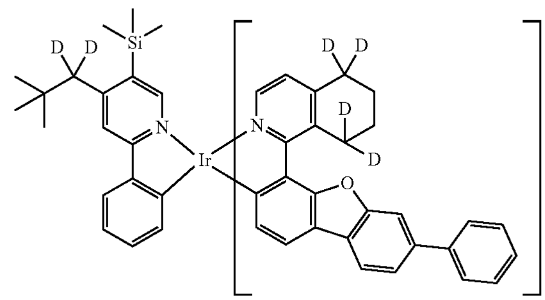
3141
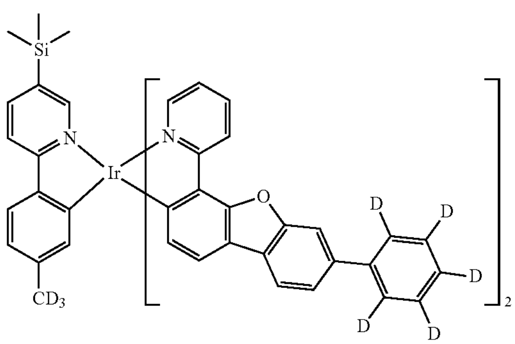
3142
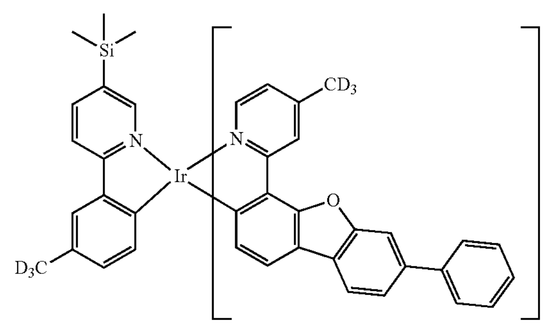
3143
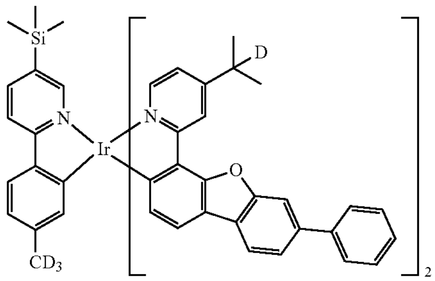
3144
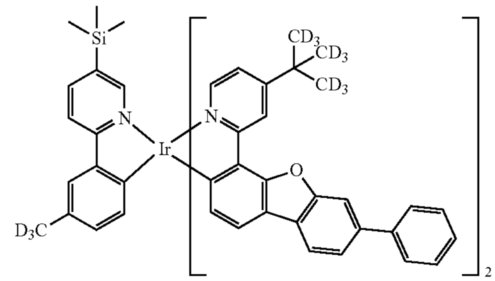

-continued
3145
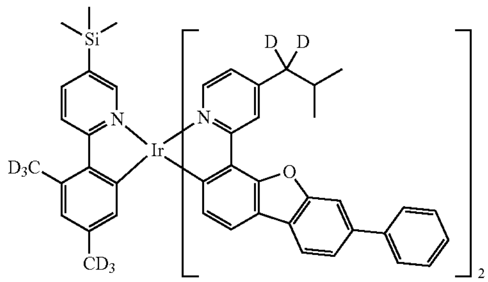
3146
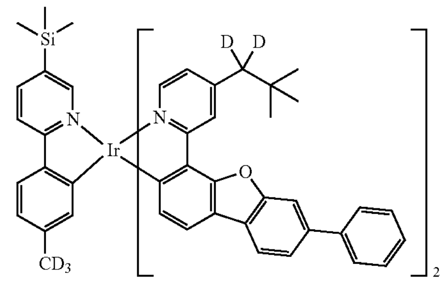
3147
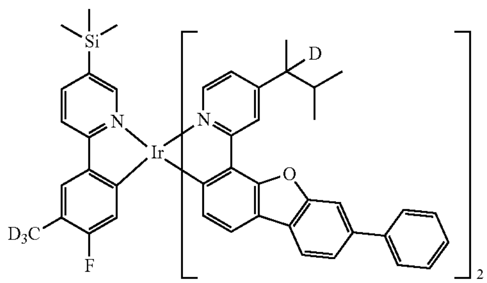
3148
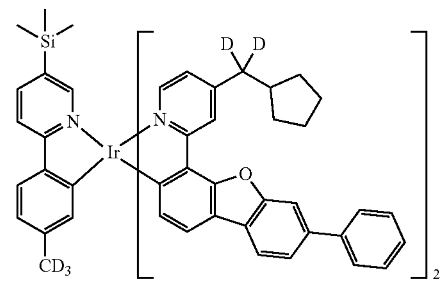
3149
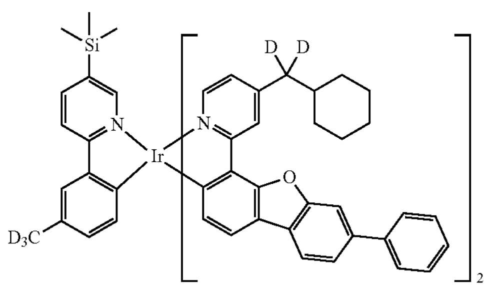
3150
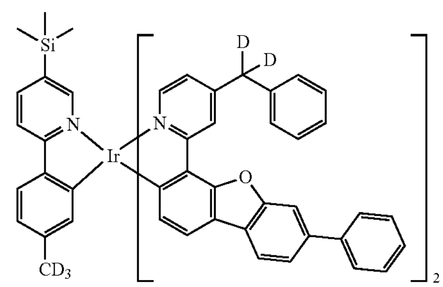
3151
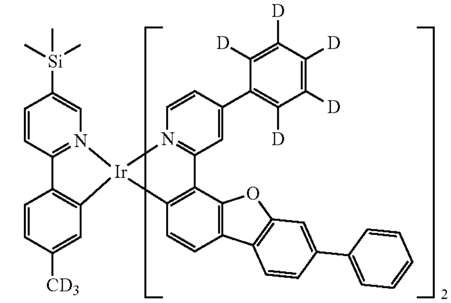
3152
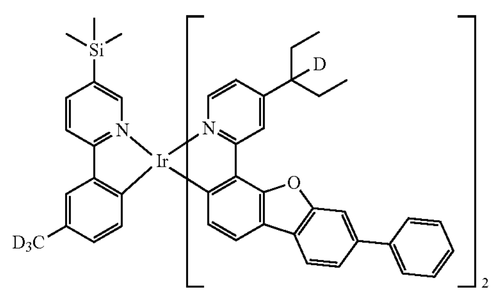
3153
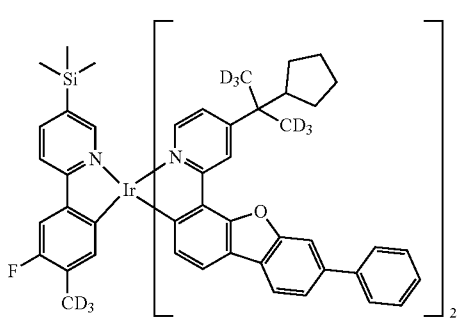
3154
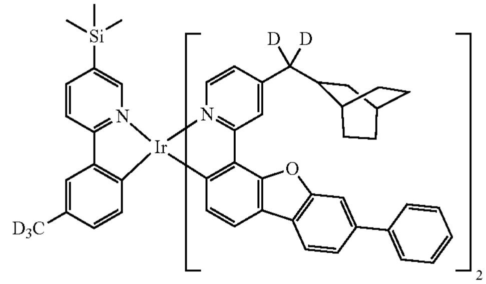

-continued
3155
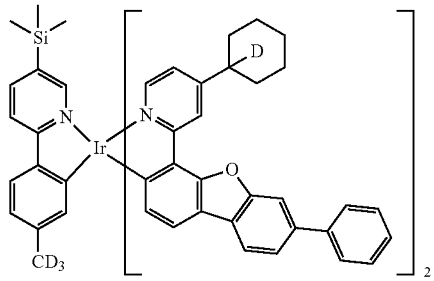
3156
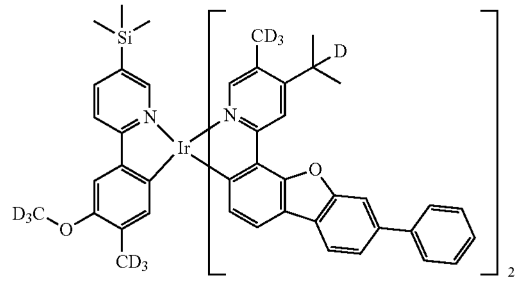
3157
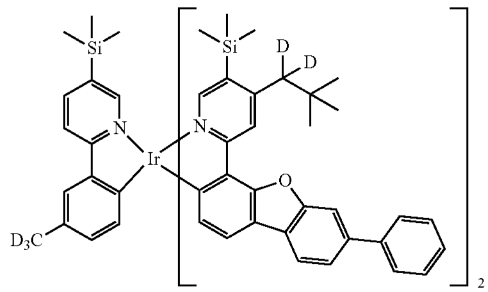
3158
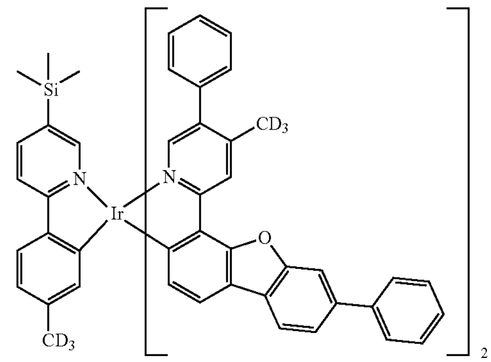
3159
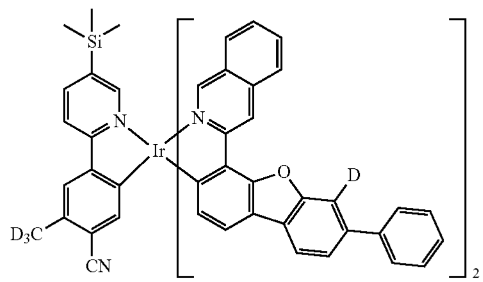
3160
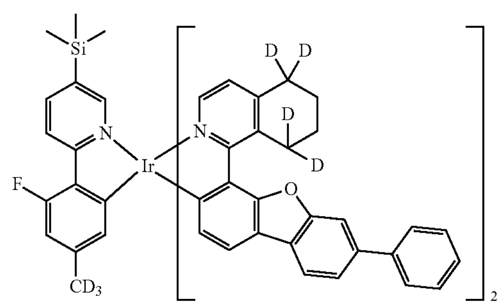
3161
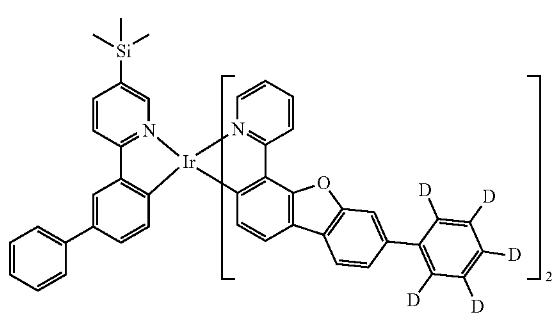
3162
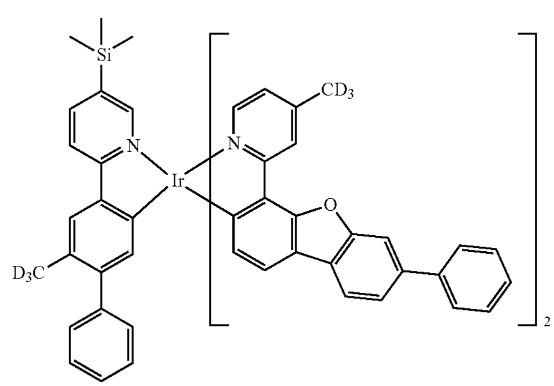

-continued
3163
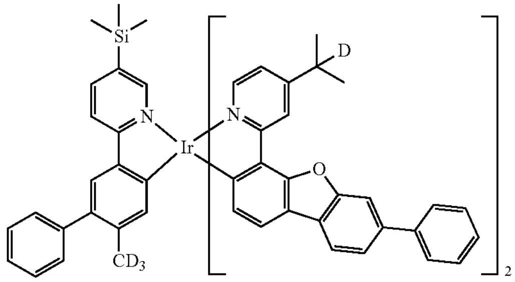
3164
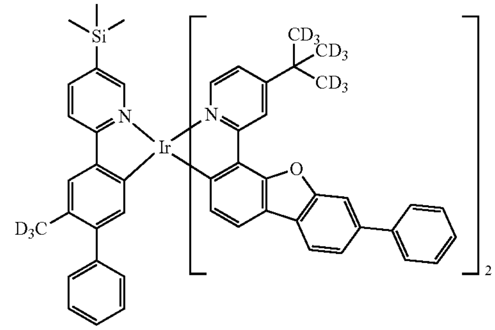
3165
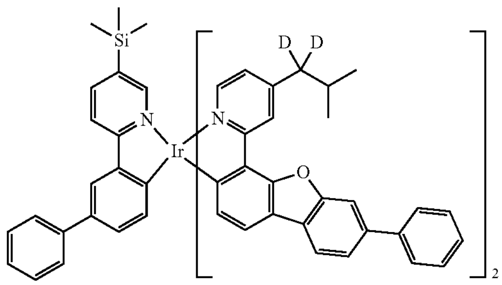
3166
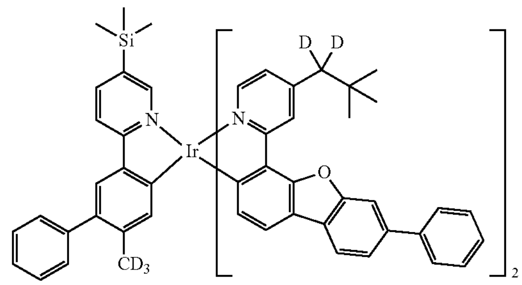
3167
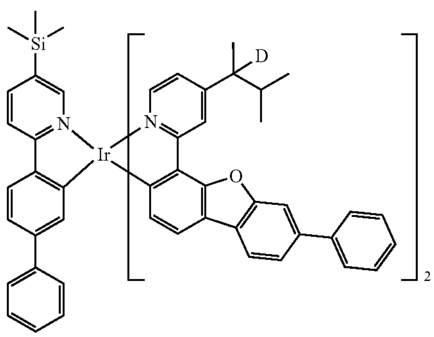
3168
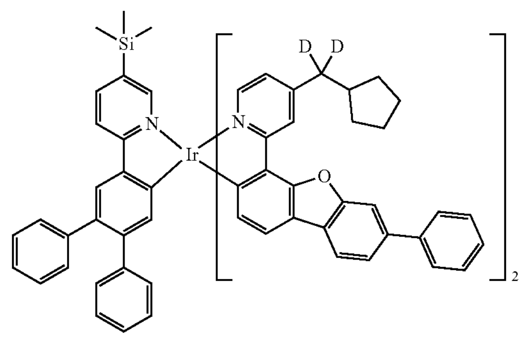
3169
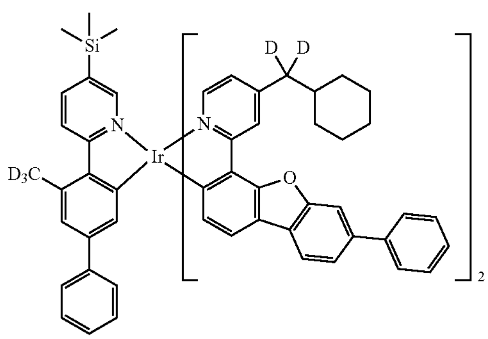
3170
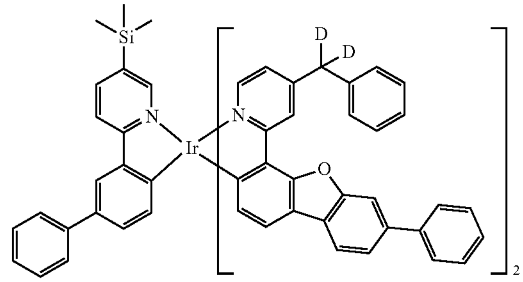
3171
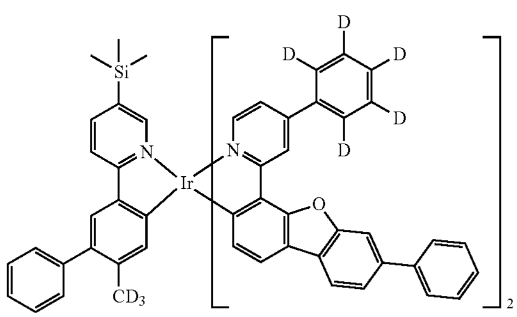
3172
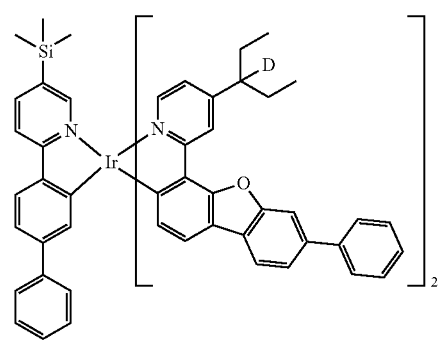

-continued
3173
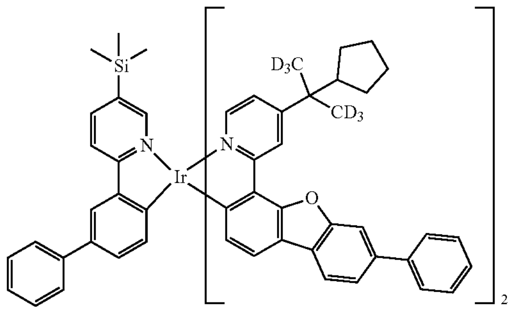
3174
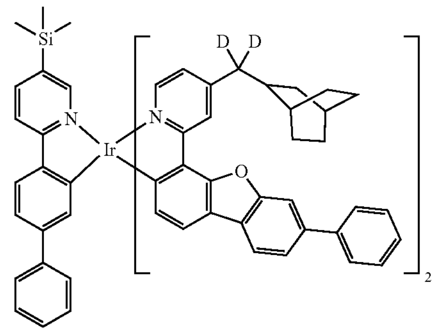
3175
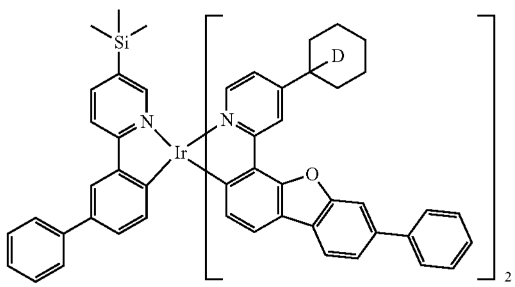
3176
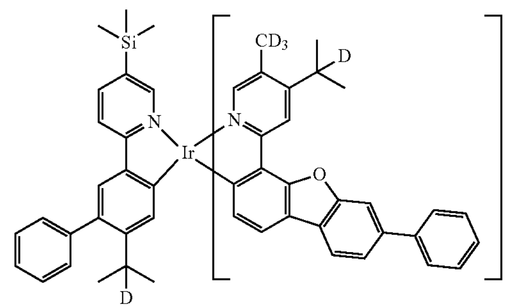
3177
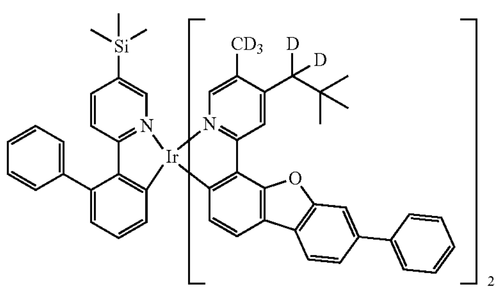
3178
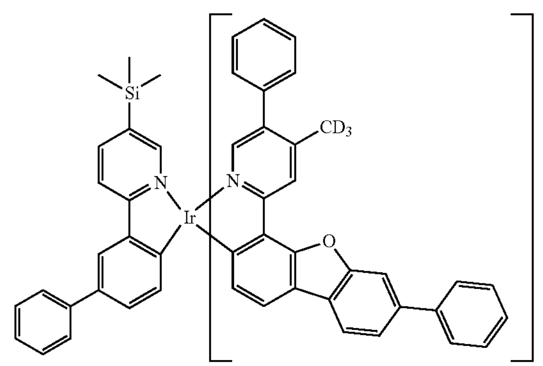
3179
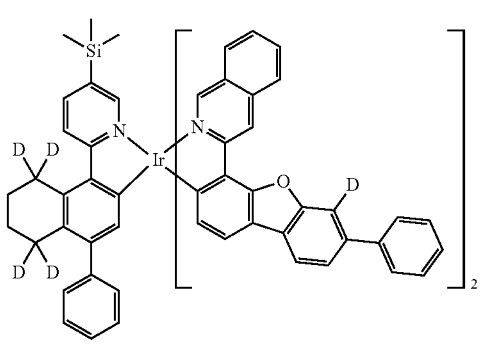
3180
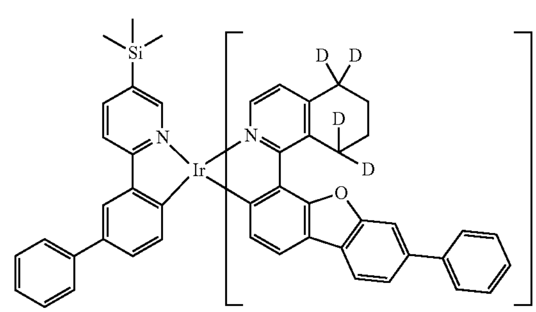

-continued
3181
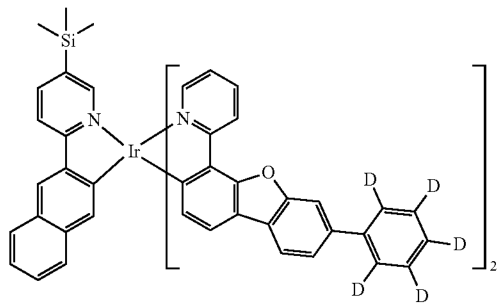
3182
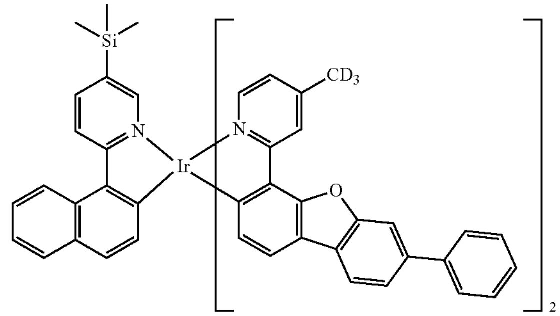
3183
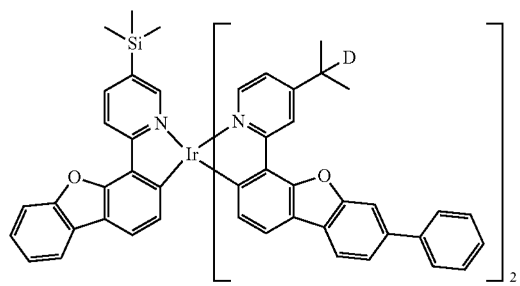
3184
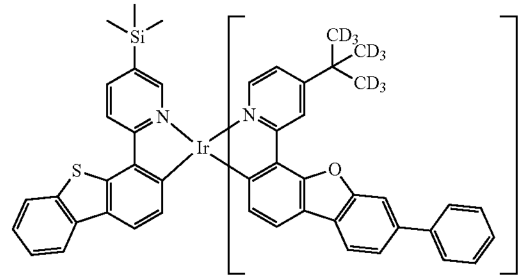
3185
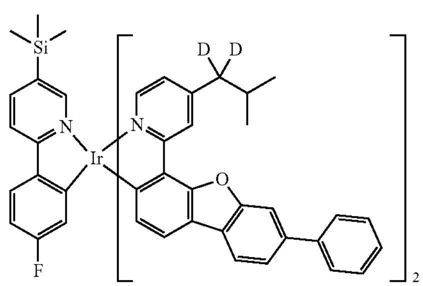
3186
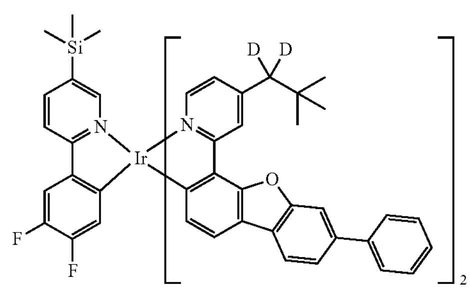
3187
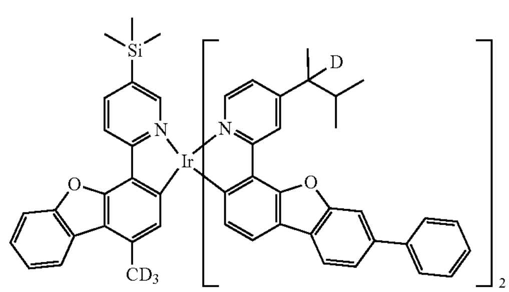
3188
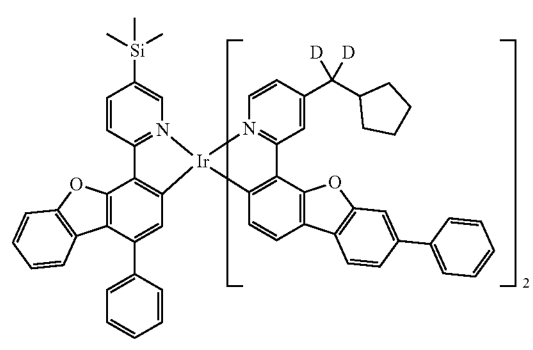
3189
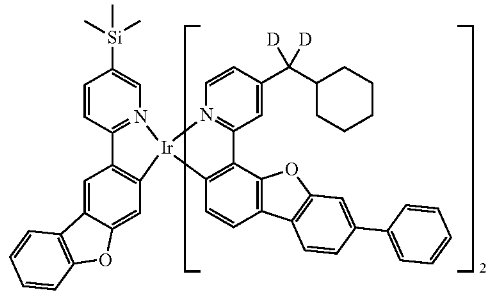
3190
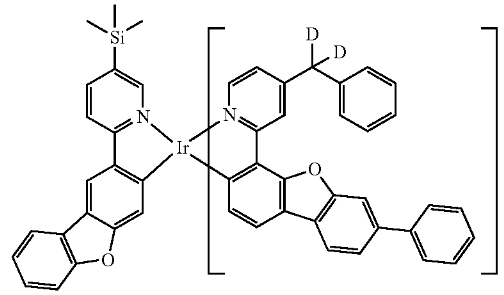

-continued
3191
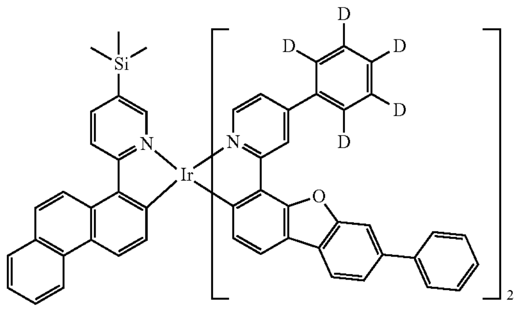
3192
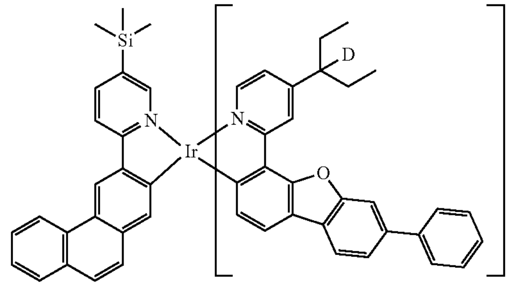
3193
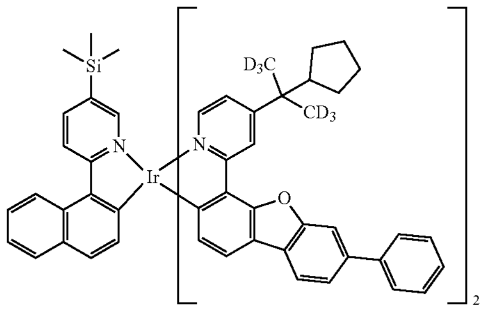
3194
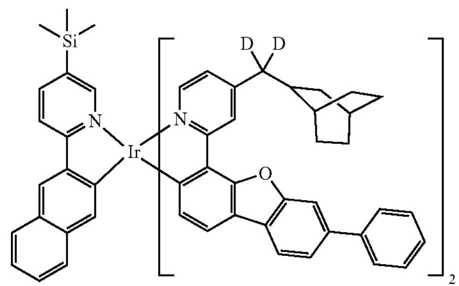
3195
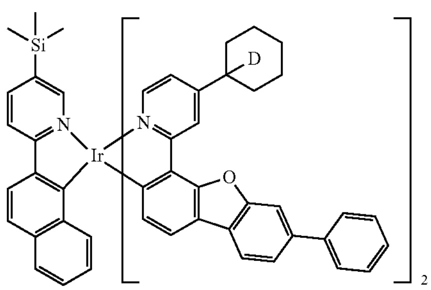
3196
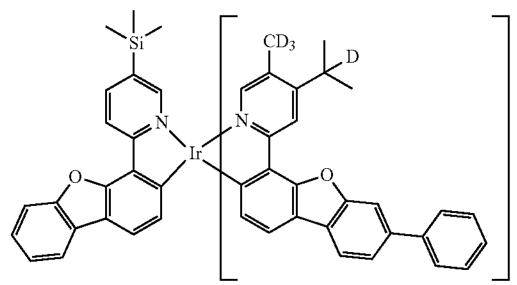
3197
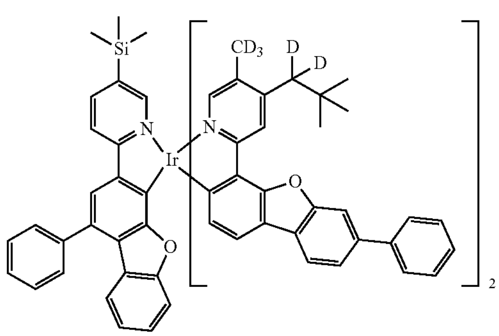
3198
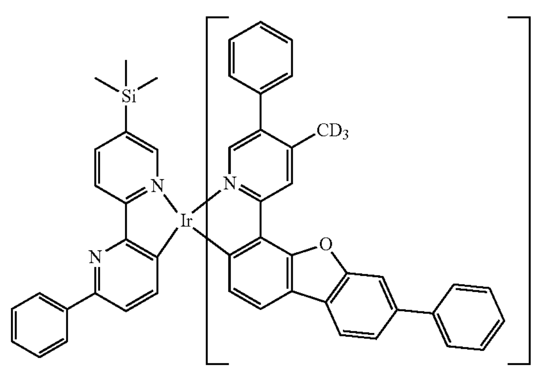

-continued
3199
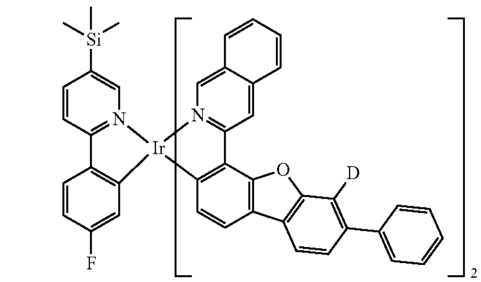
3201
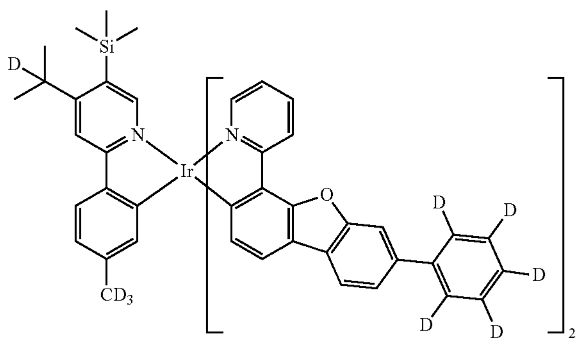
3202
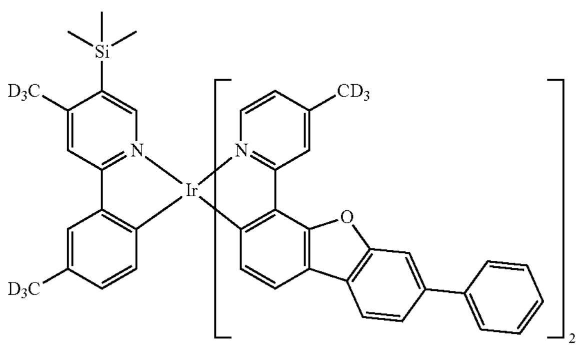
3203
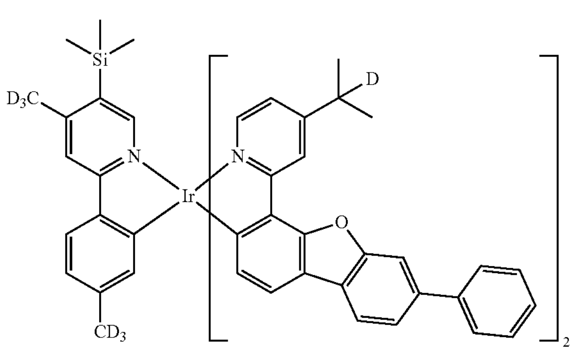
3200
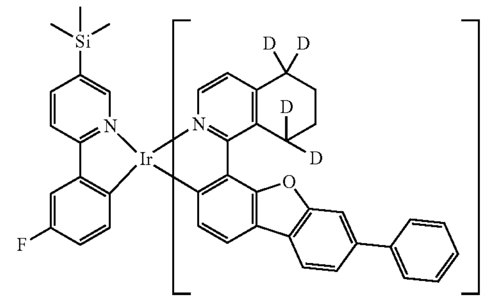
-continued
3204
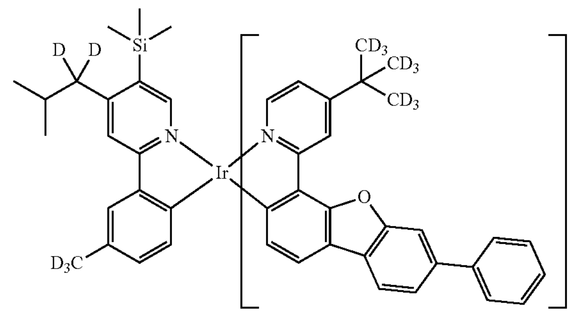
3205
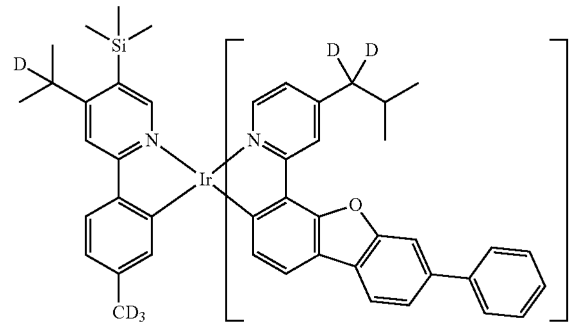
3206
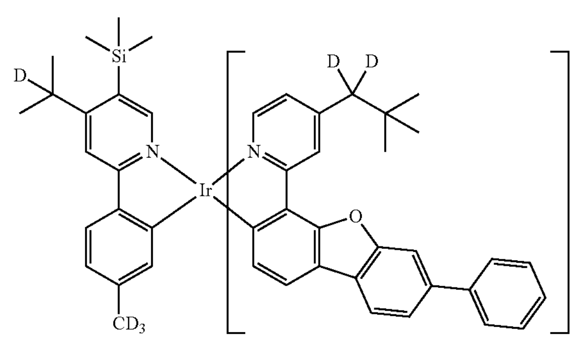

-continued
3207
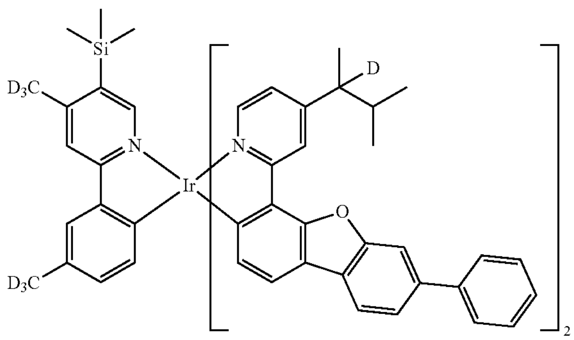
3208
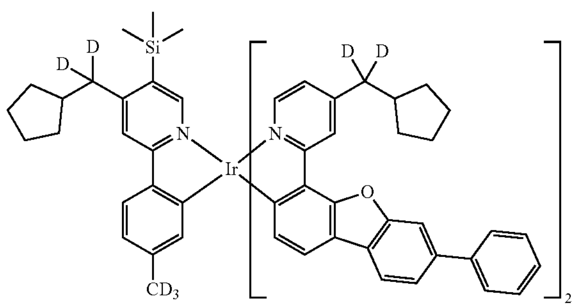
3209
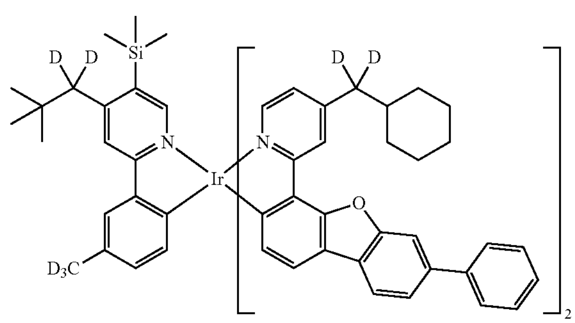
3210
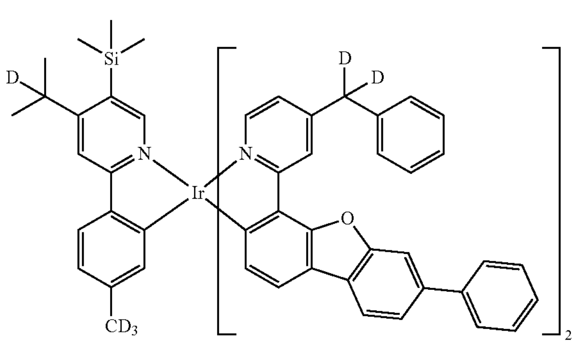
-continued
3211
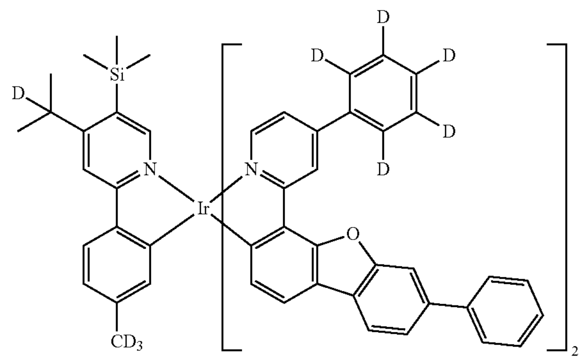
3212
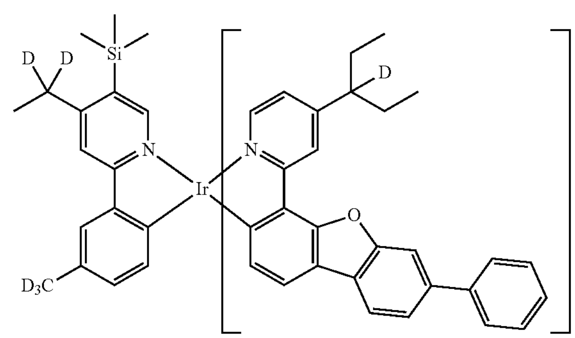
3213
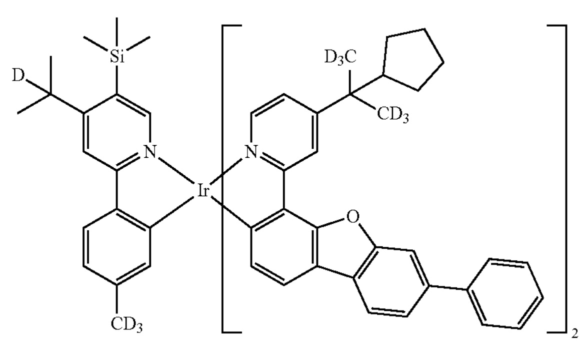
3214
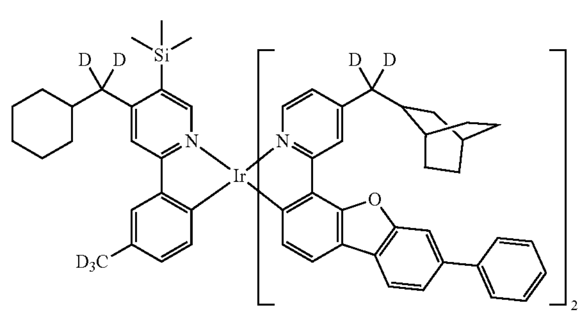

-continued
3215
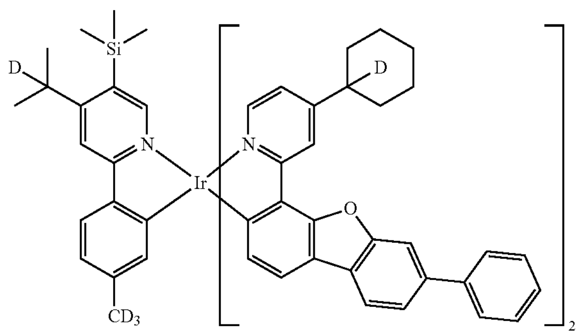
3216
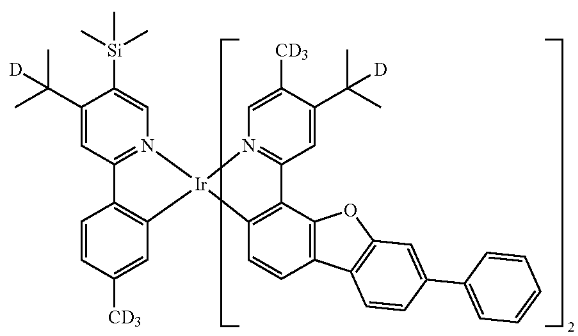
3217
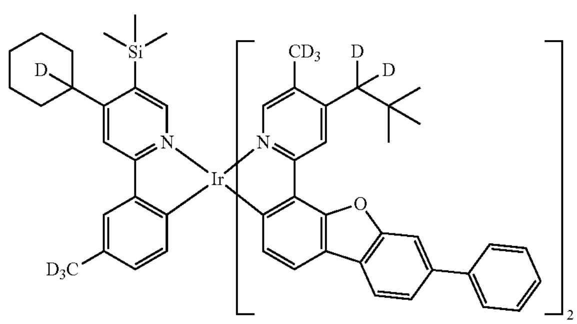
3218
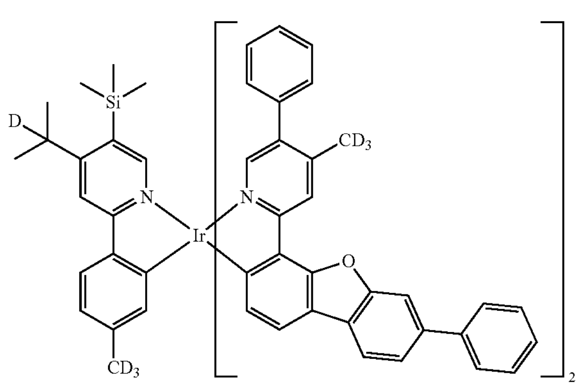
-continued
3219
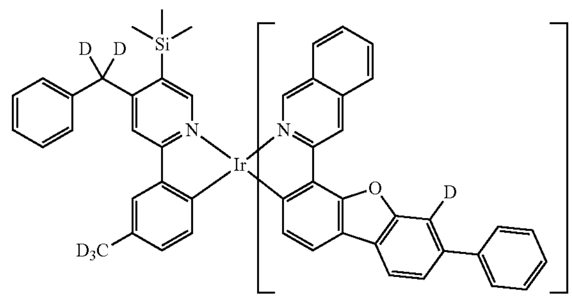
3220
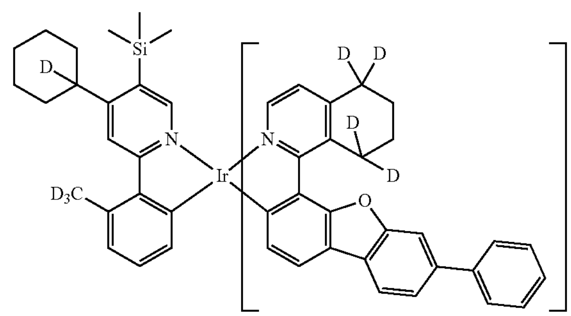
3221
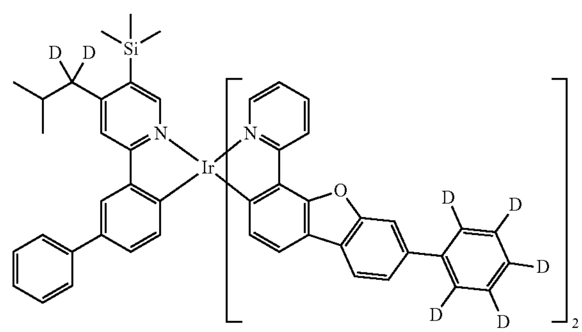
3222
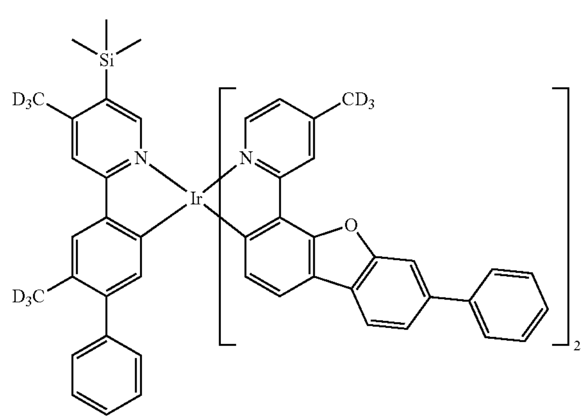

-continued
3223
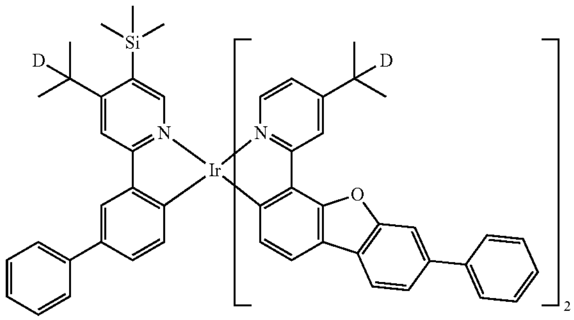
3224
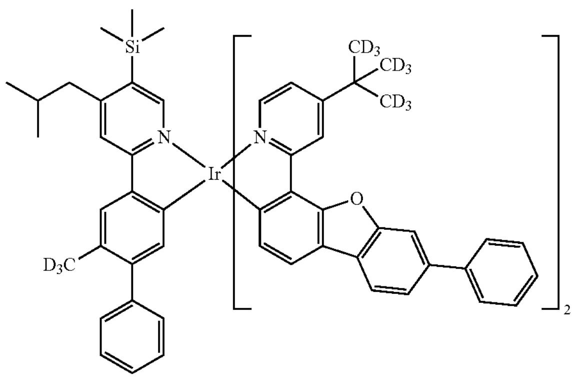
3225
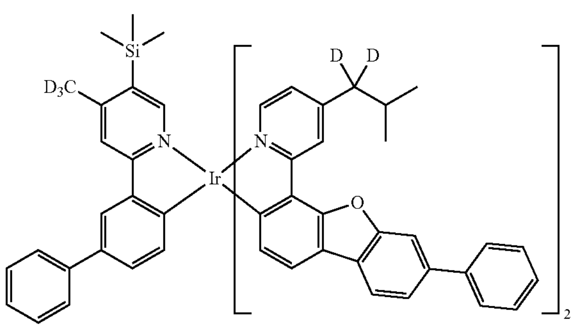
3226
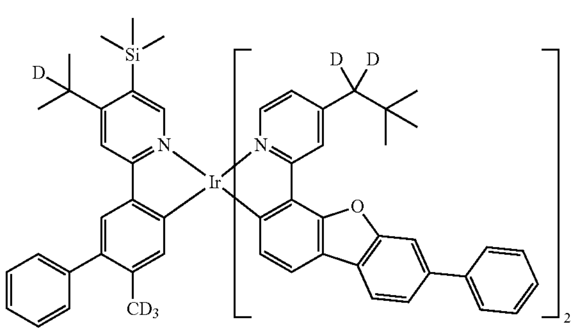
-continued
3227
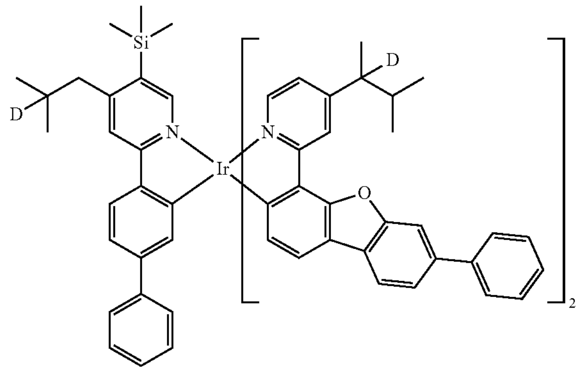
3228
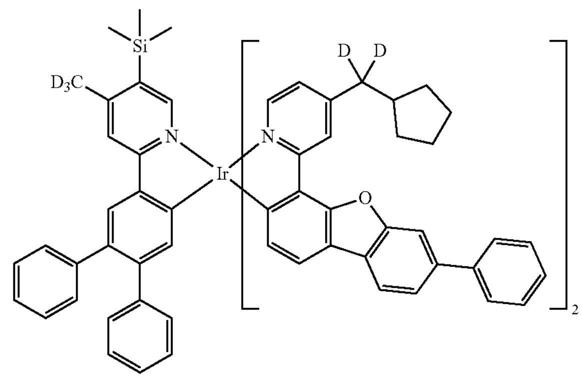
3229
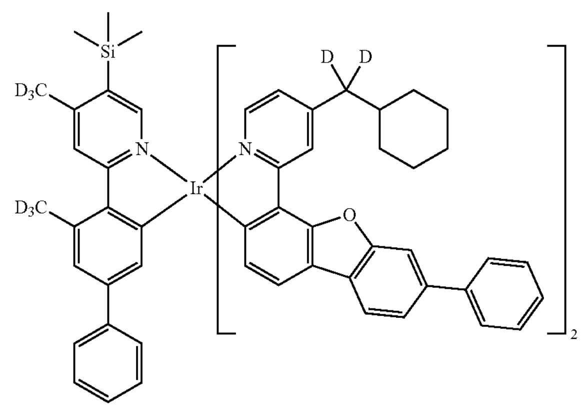
3230
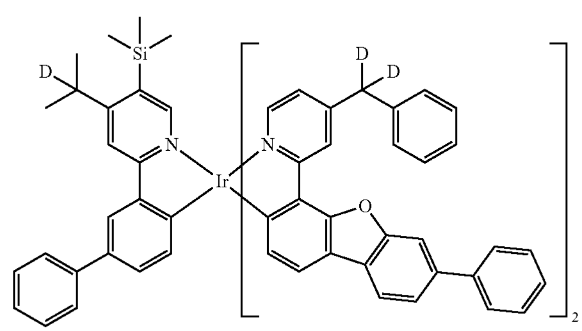

-continued
3231
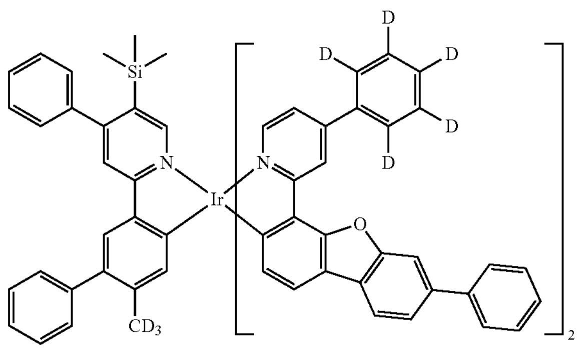
3232
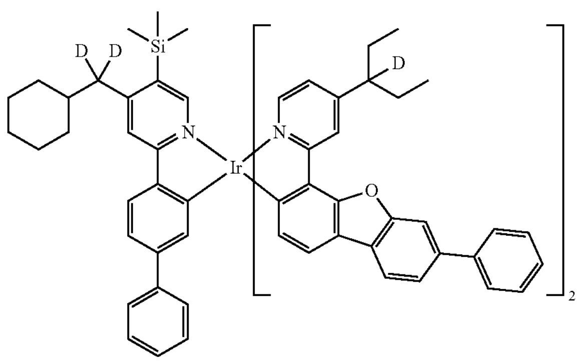
3233
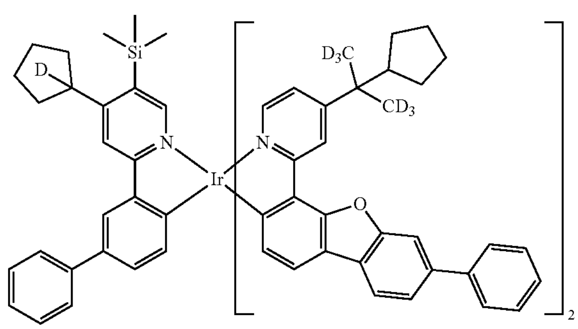
3234
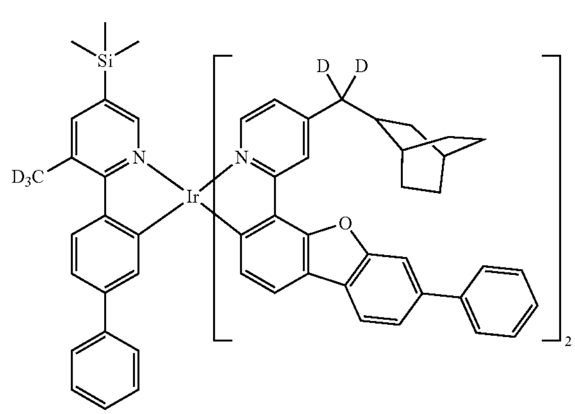
-continued
3235
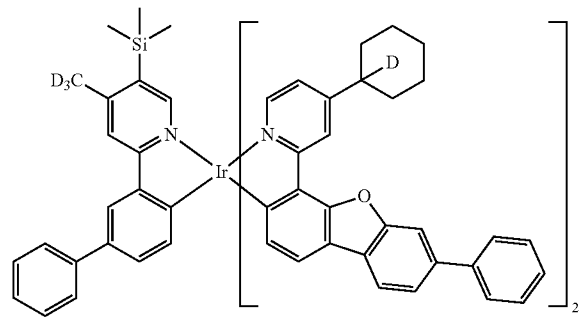
3236
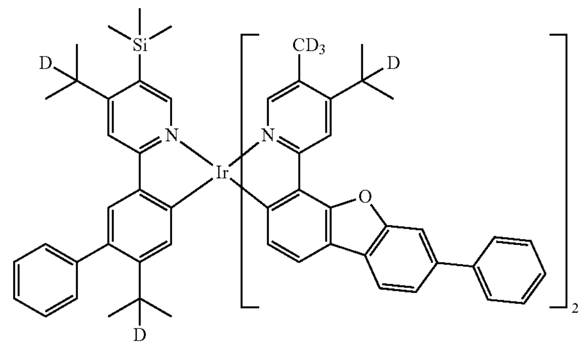
3237
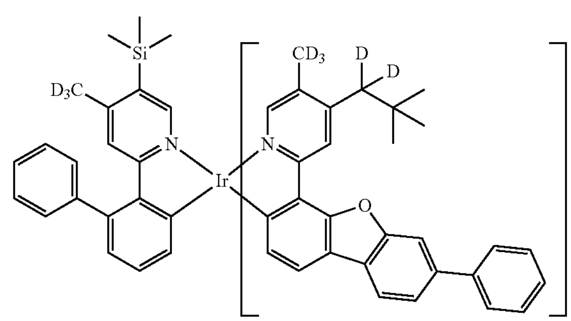
3238
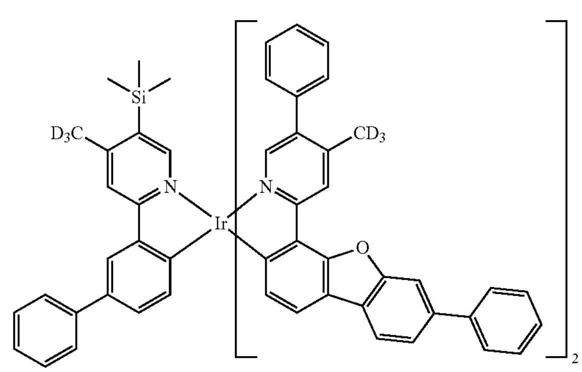

3239
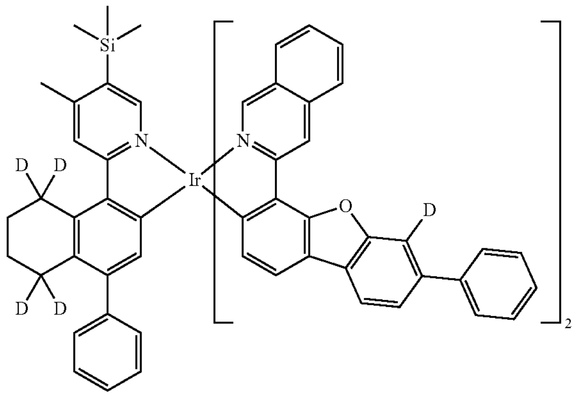
3240
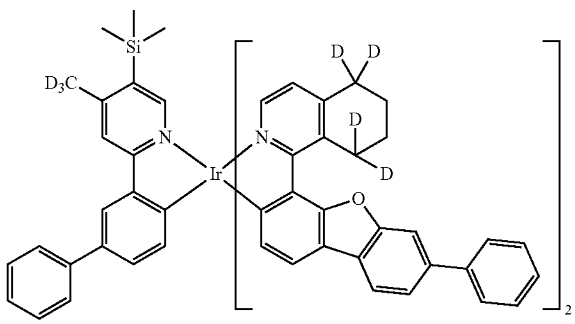
3241
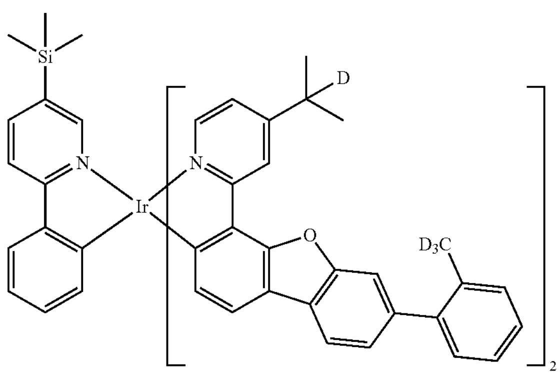
3242
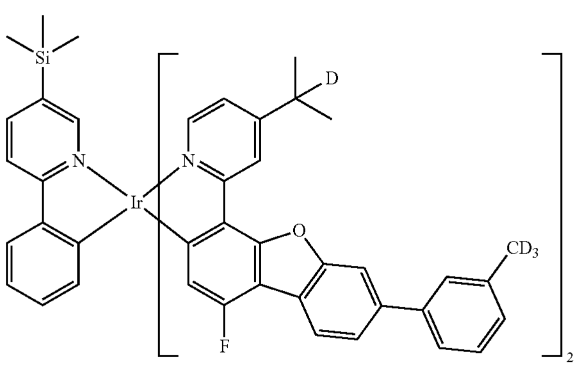
3243
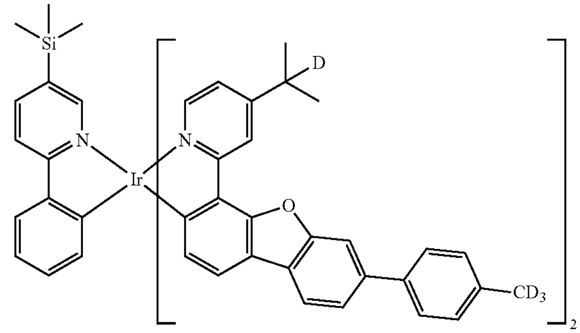
3244
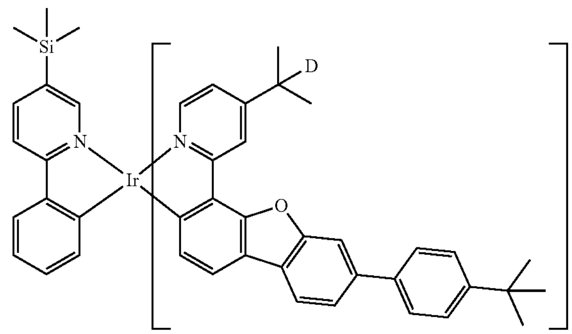
3245
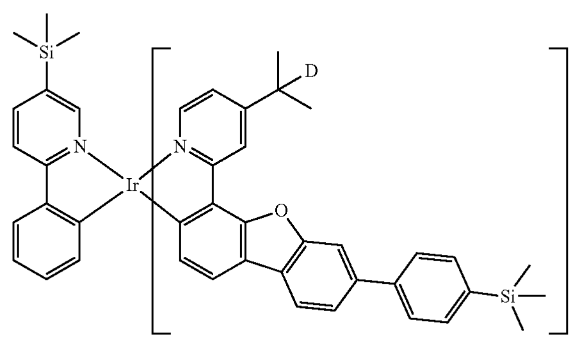
3246
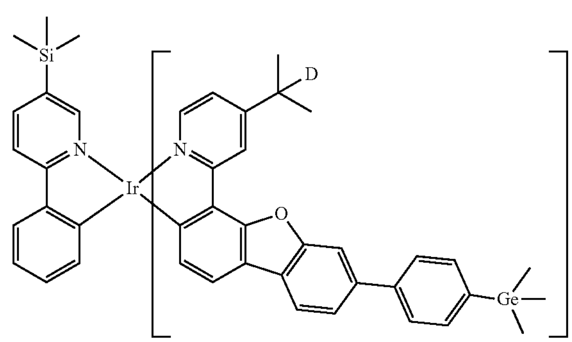

-continued
3247
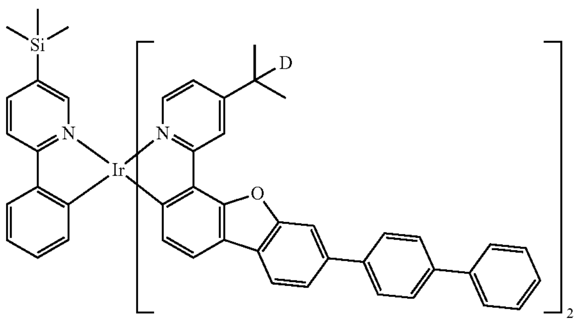
3248
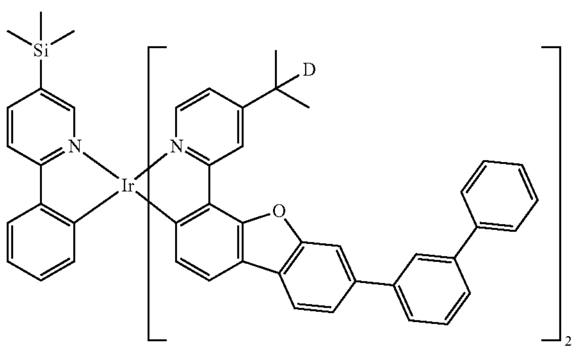
3249
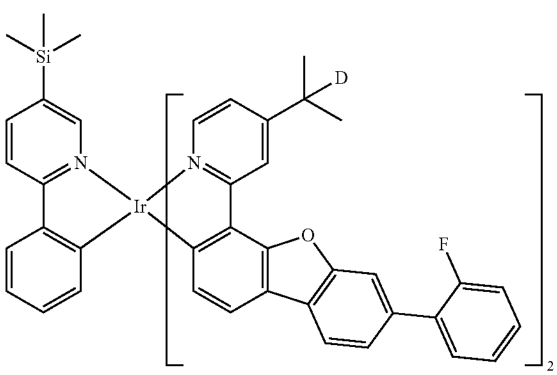
3250
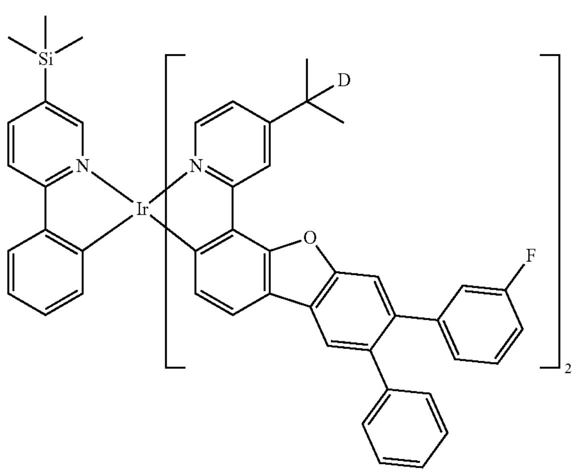
-continued
3251
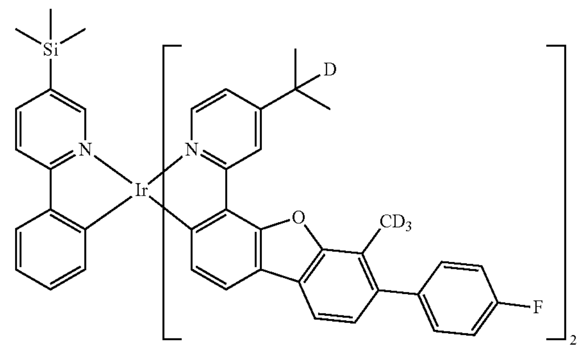
3252
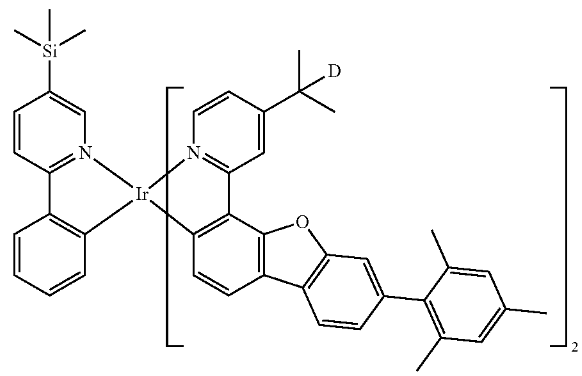
3253
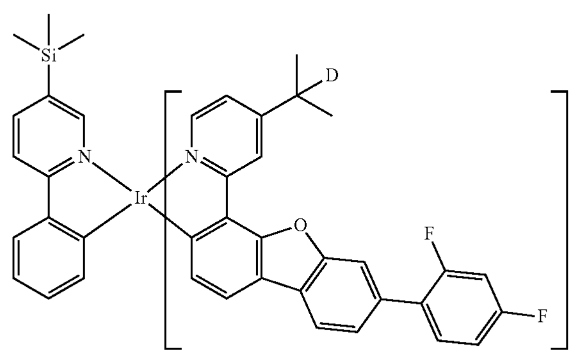
3254
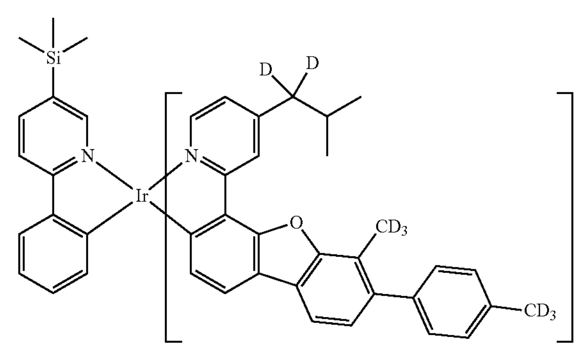

-continued
3255
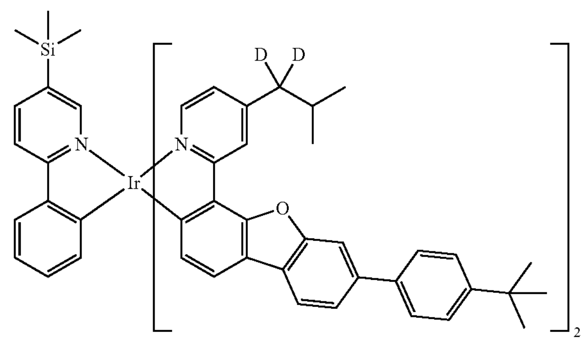
3256
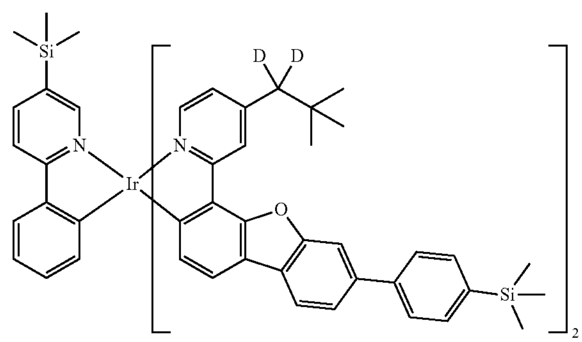
3257
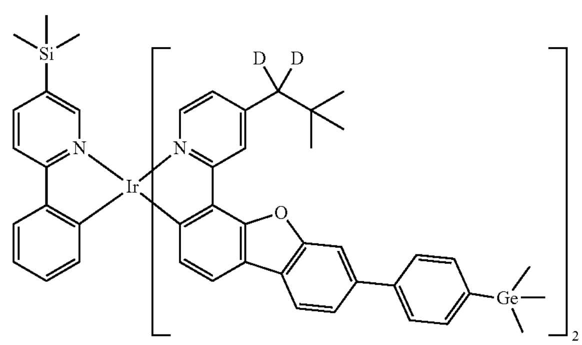
3258
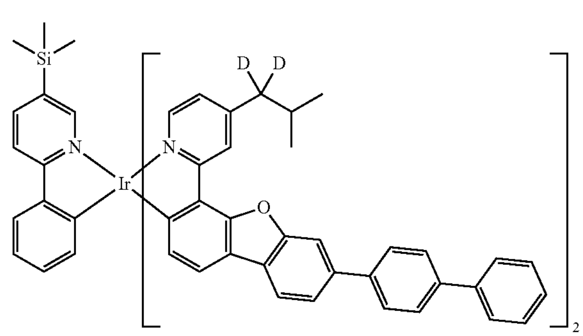
-continued
3259
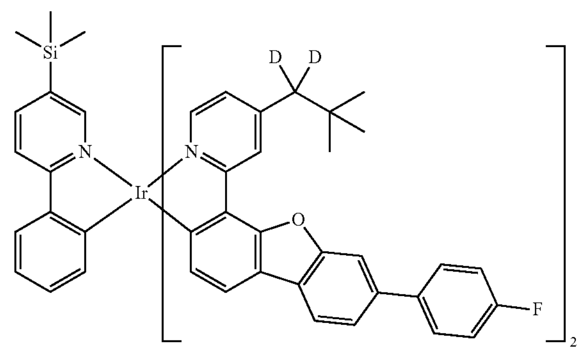
3260
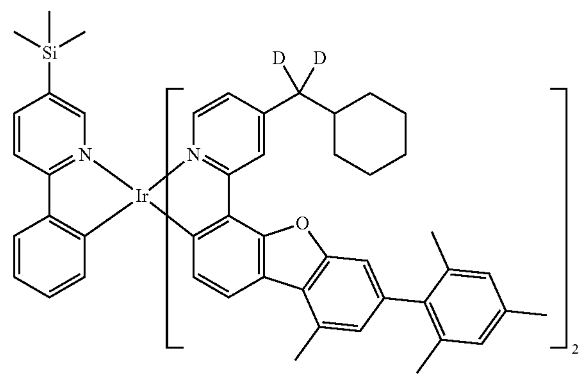
3261
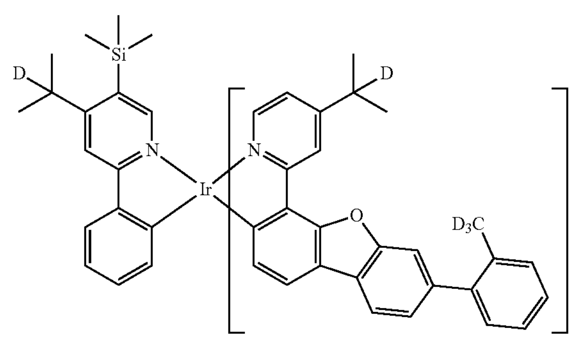
3262
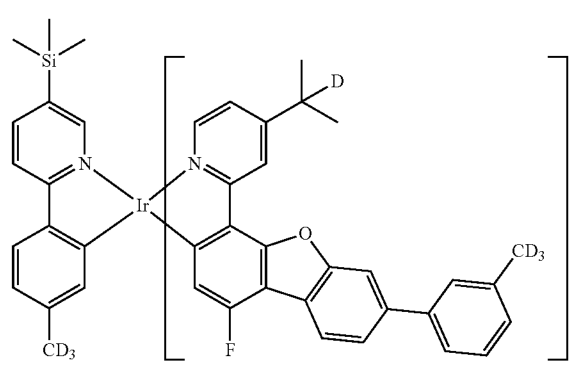

3263
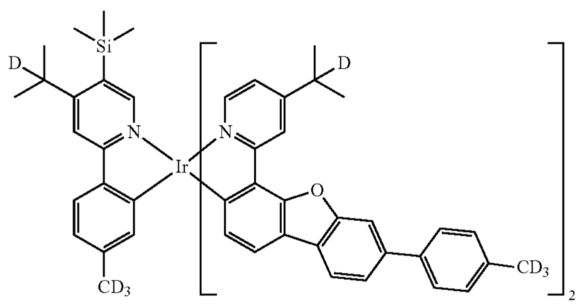
3264
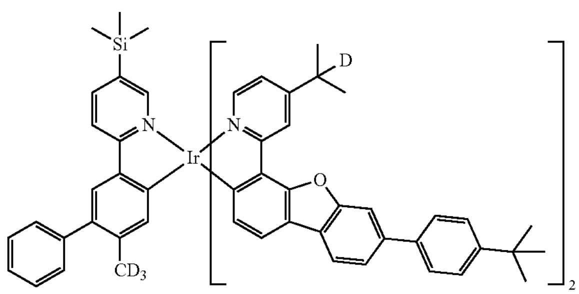
3265
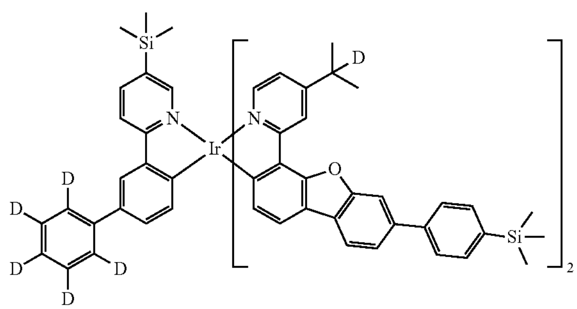
3266
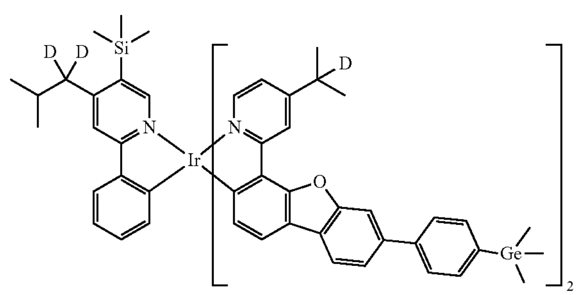
3267
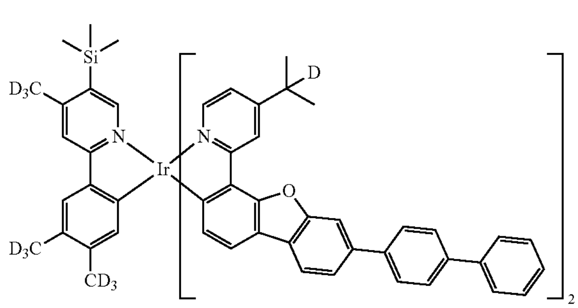
3268
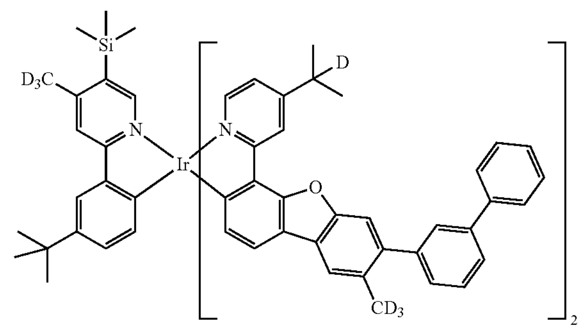
3269
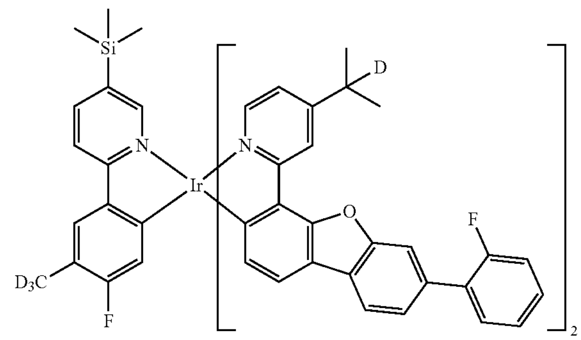
3270
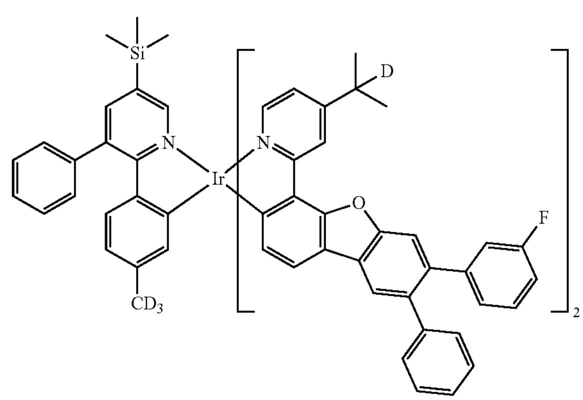
3271
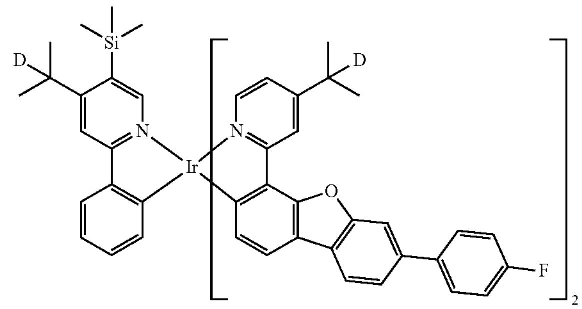

-continued
3272
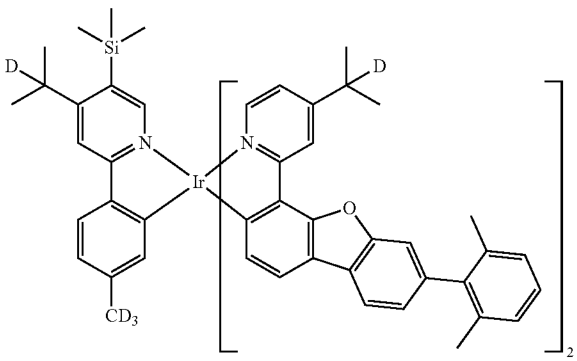
3276
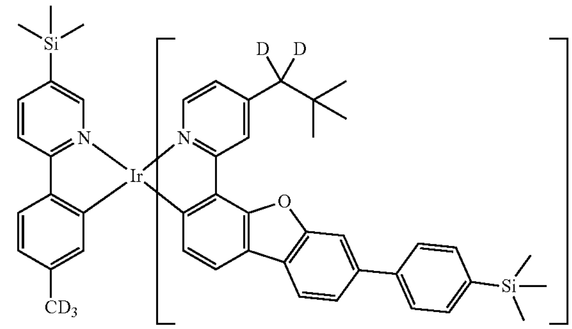
3273
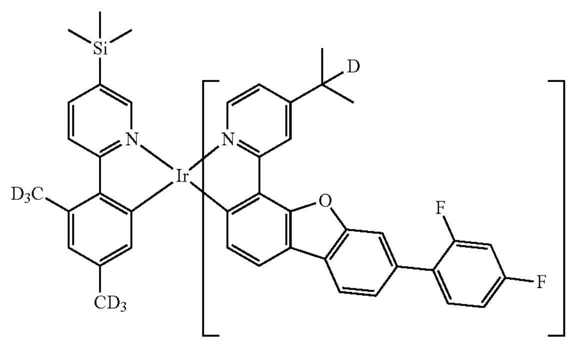
3277
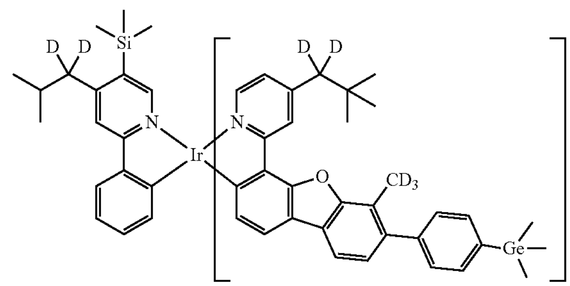
3274
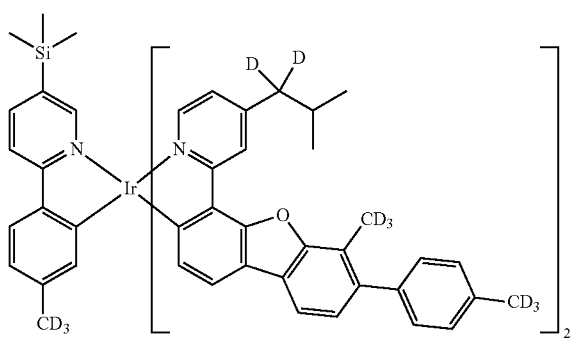
3278
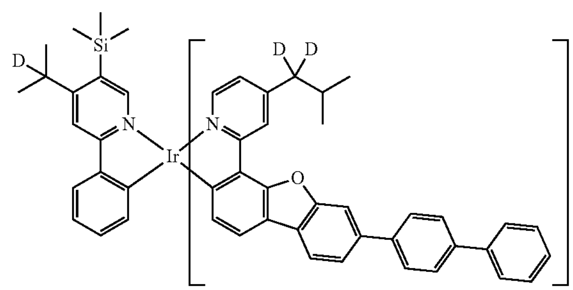
3275
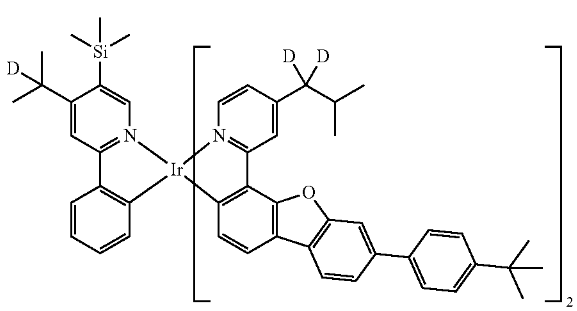
3279
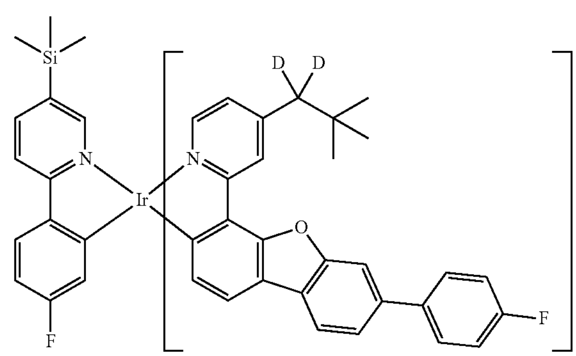

-continued
3280
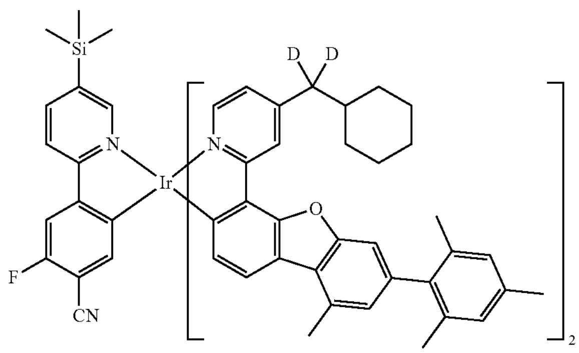
3281
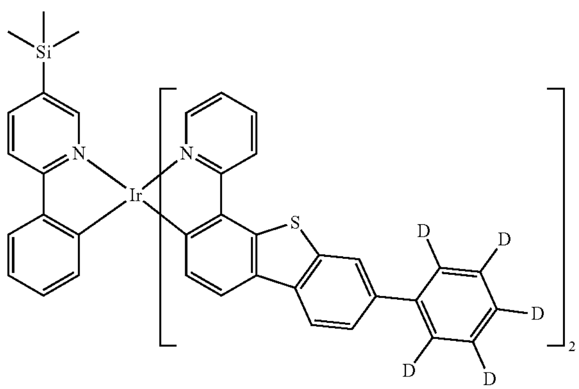
3282
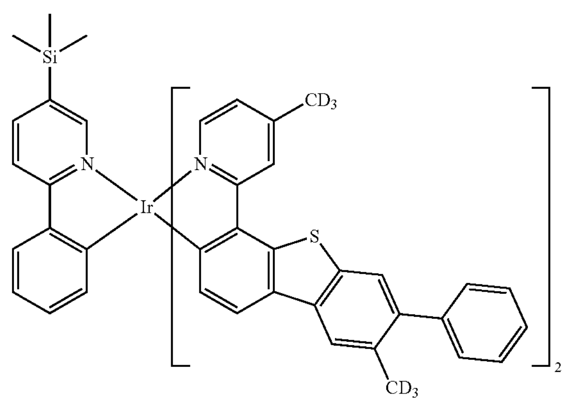
3283
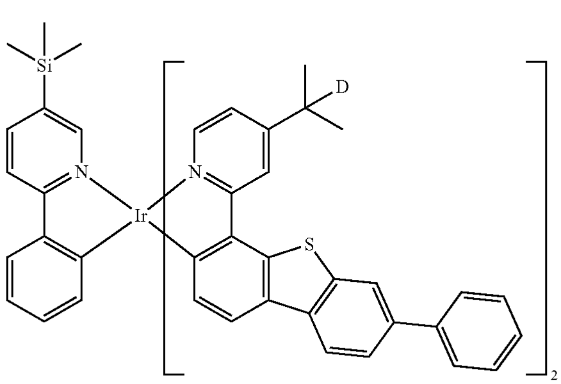
-continued
3284
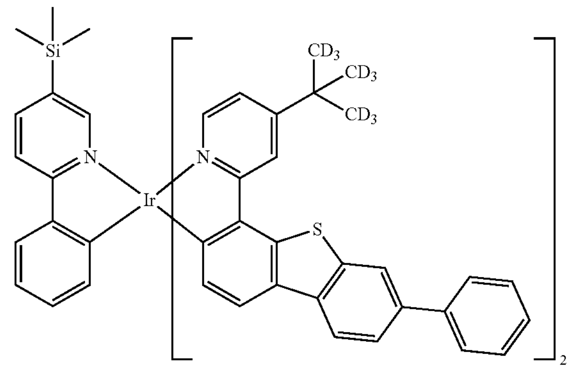
3285
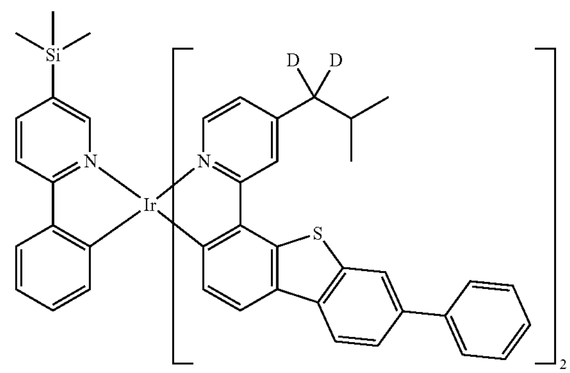
3286
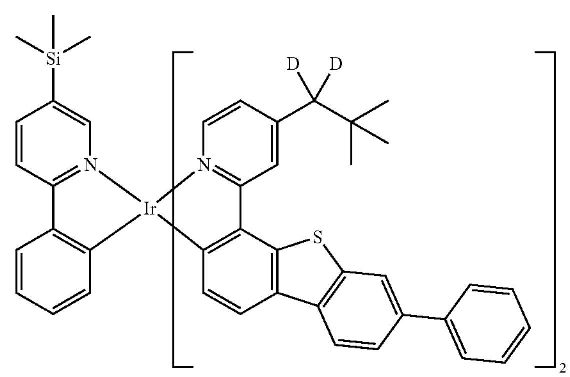
3287
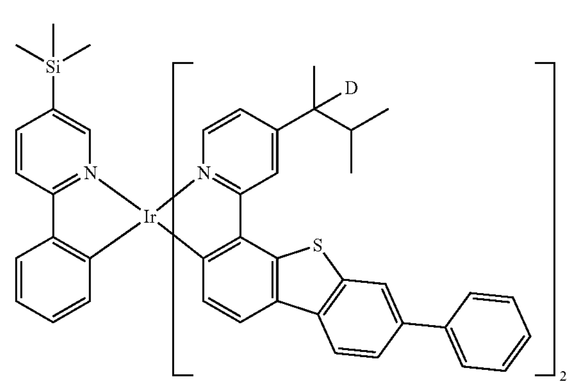

-continued
3288
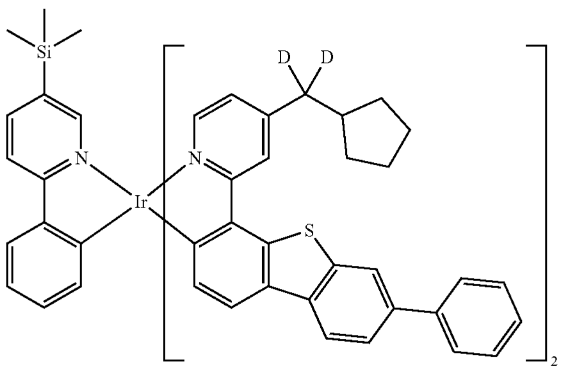
3289
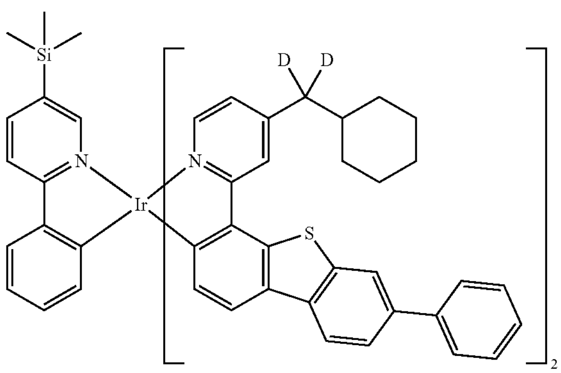
3290
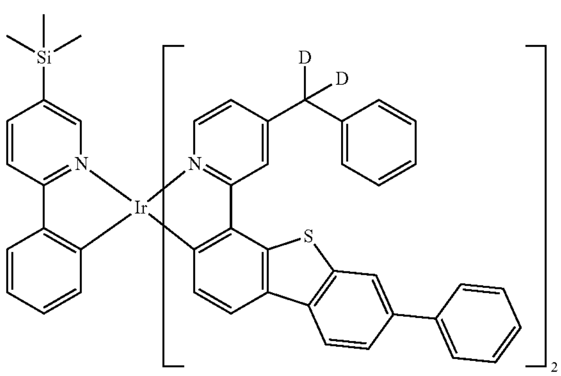
3291
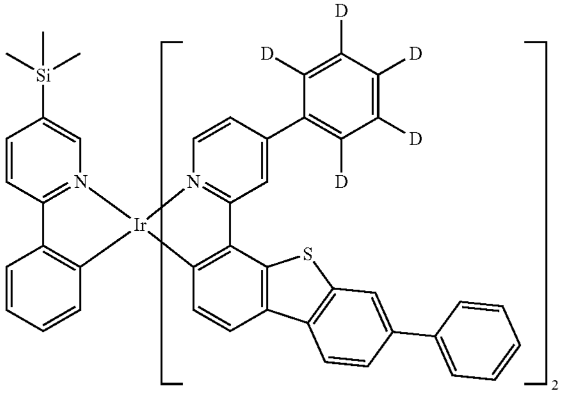
-continued
3292
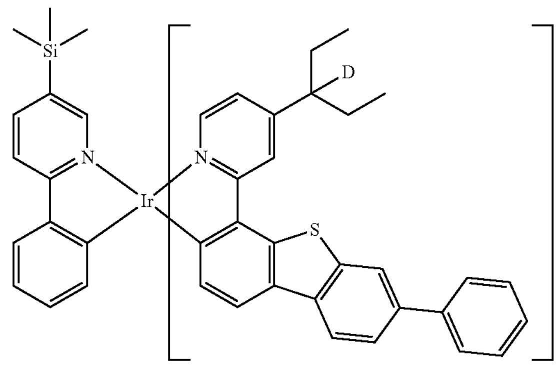
3293
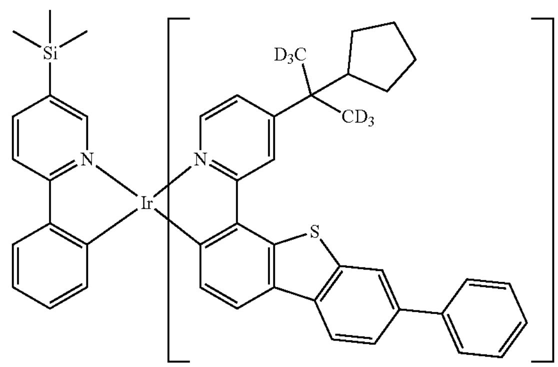
3294
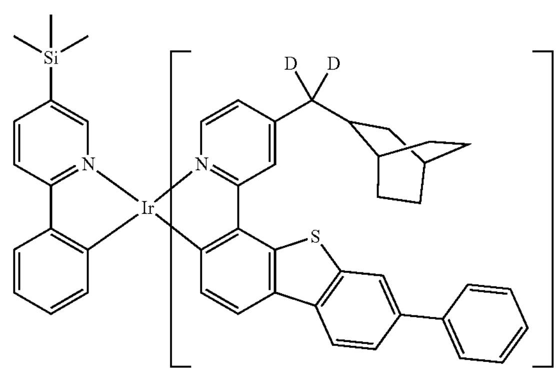
3295
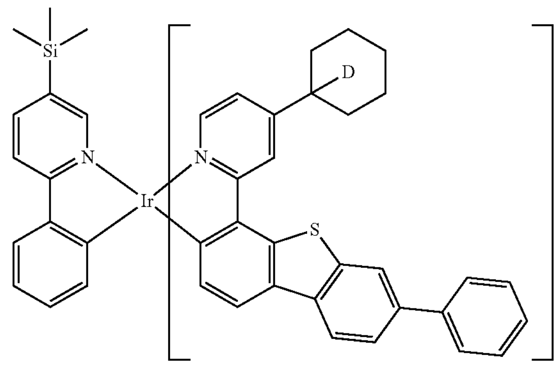

-continued
3296
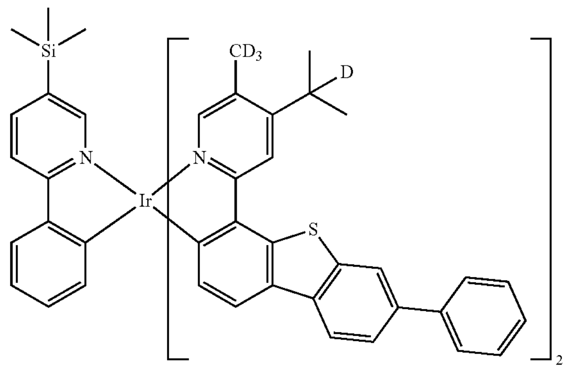
3297
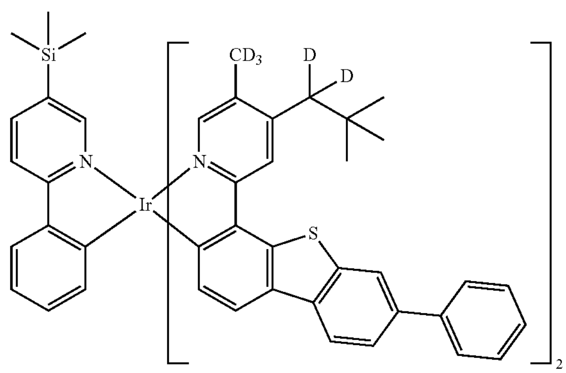
3298
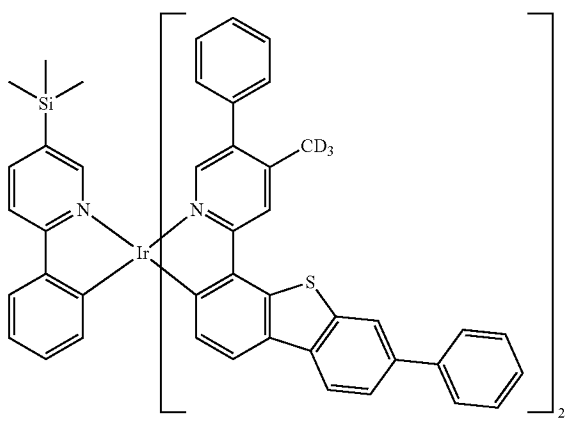
3299
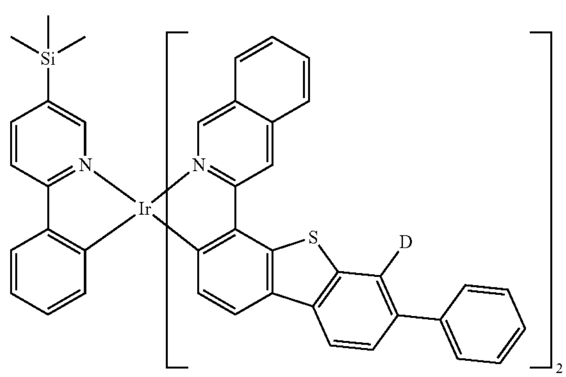
-continued
3300
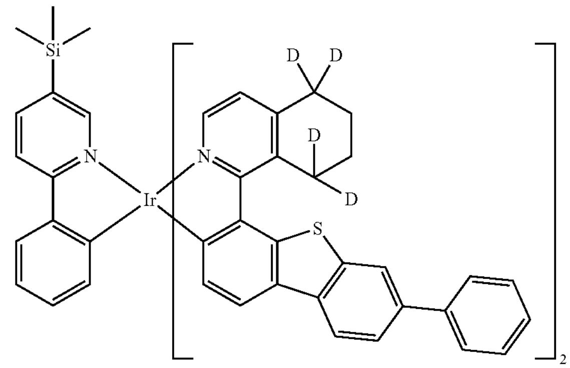
3301
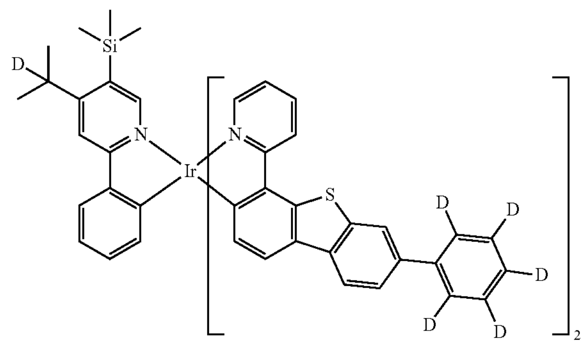
3302
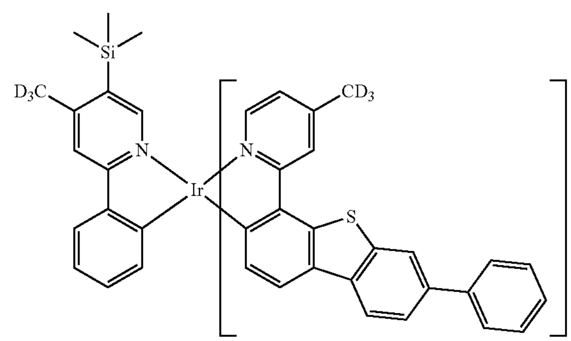
3303
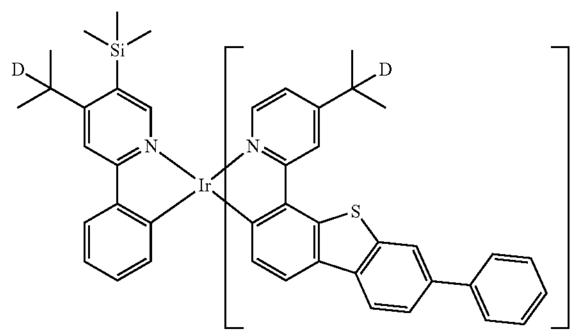

3304
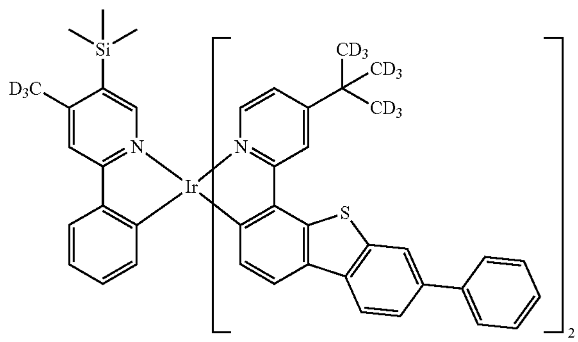
3305
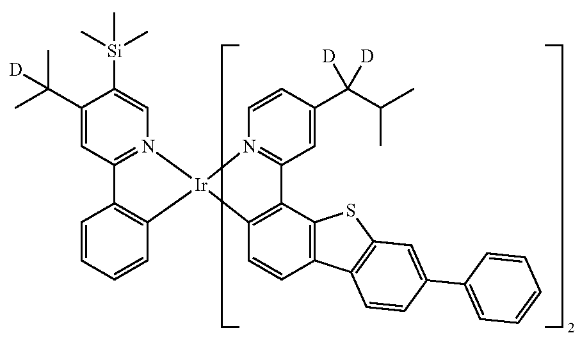
3306
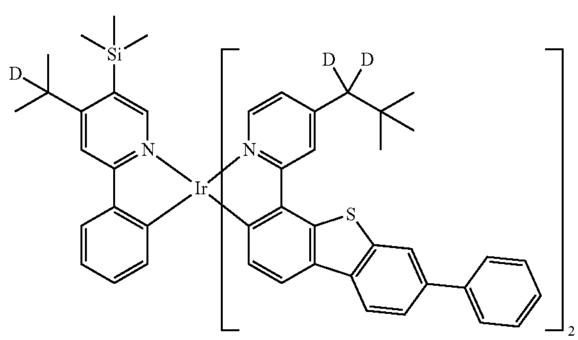
3307
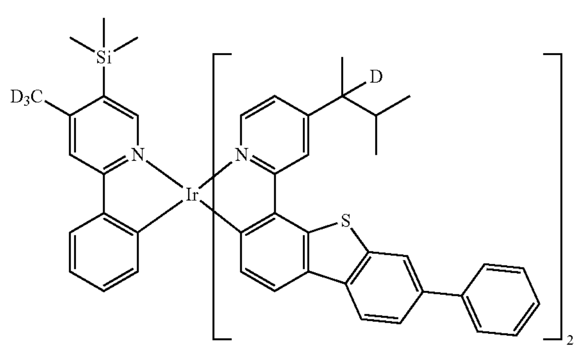
3308
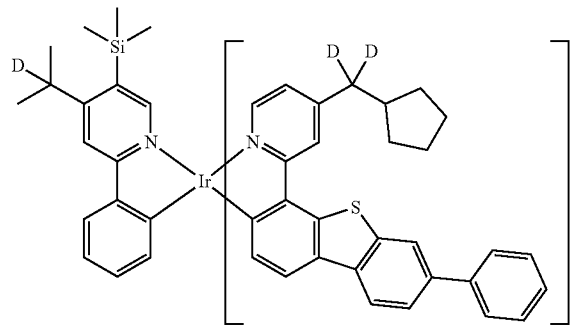
3309
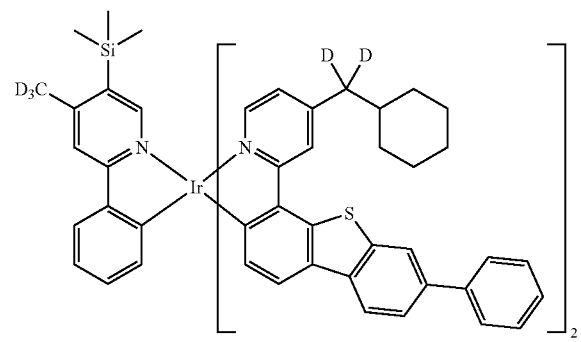
3310
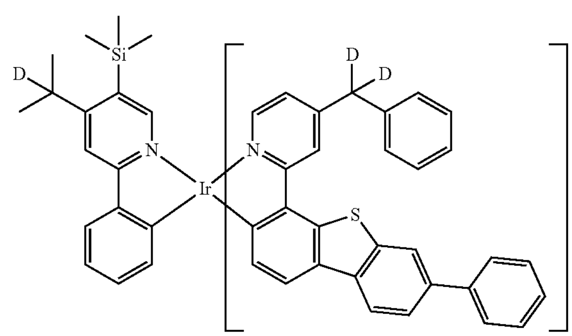
3311
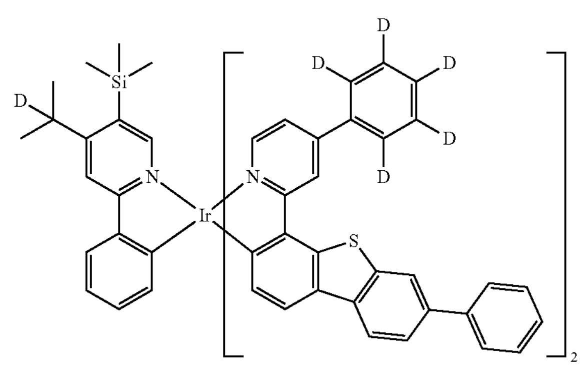

-continued
3312
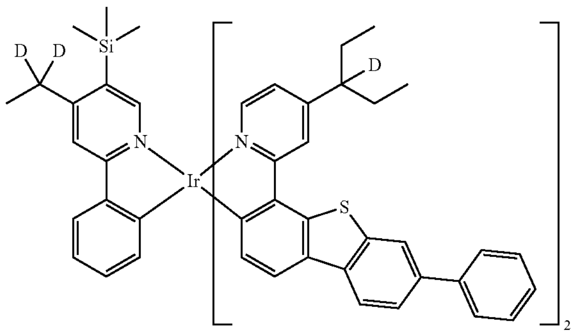
3313
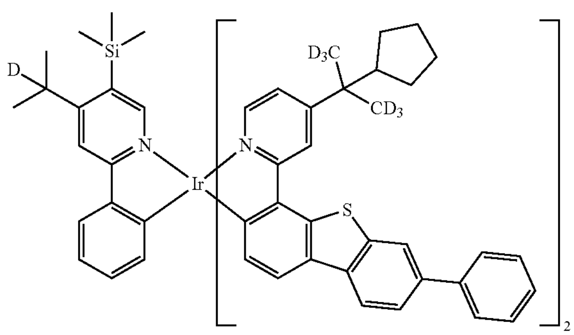
3314
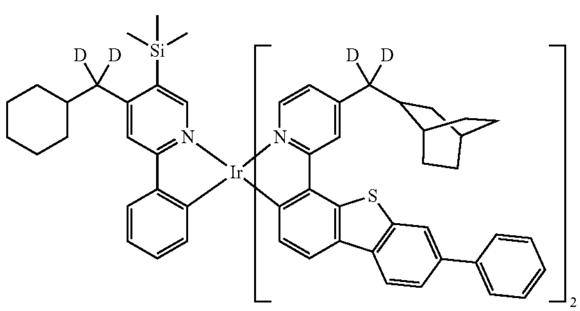
3315
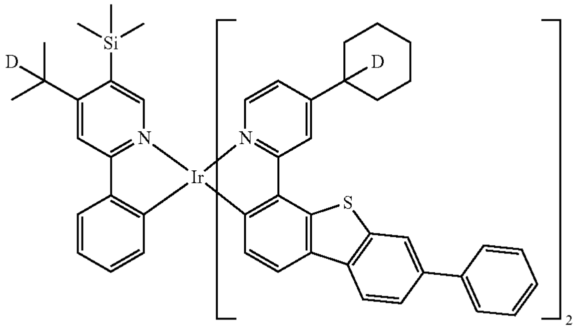
-continued
3316
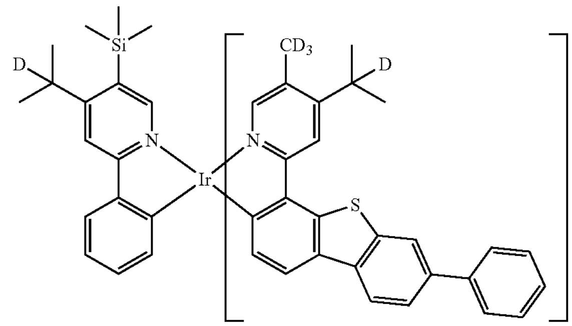
3317
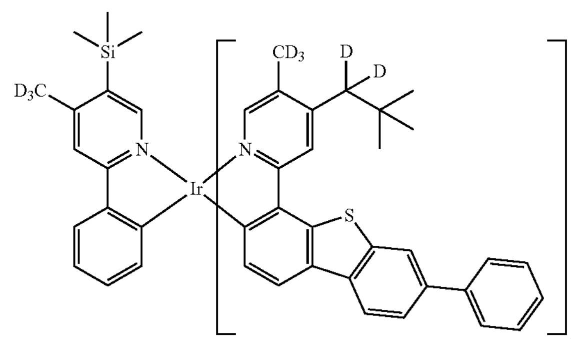
3318
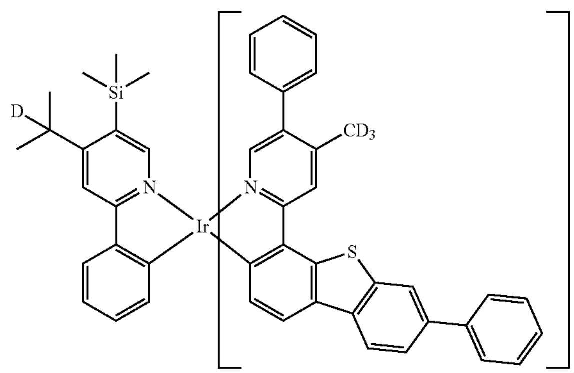
3319
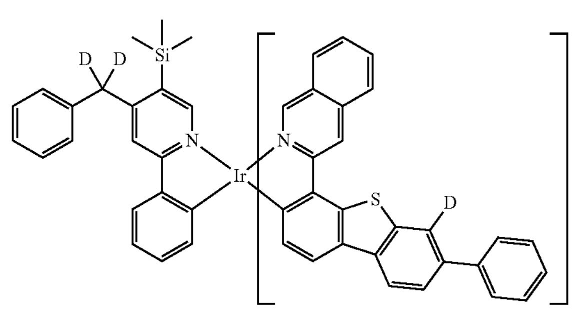

-continued
3320
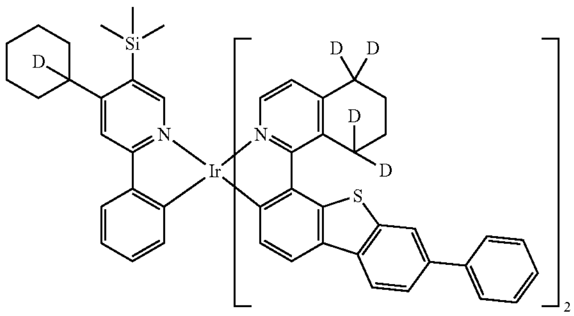
3321
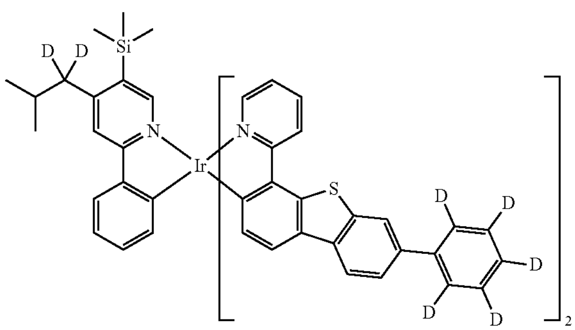
3322
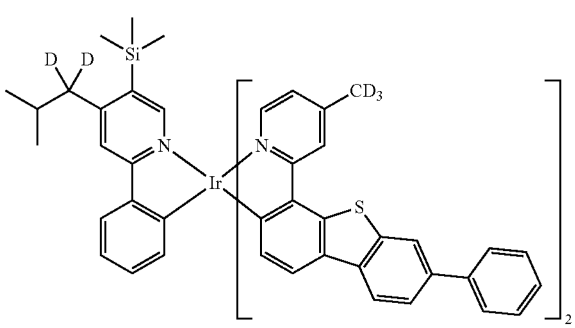
3223
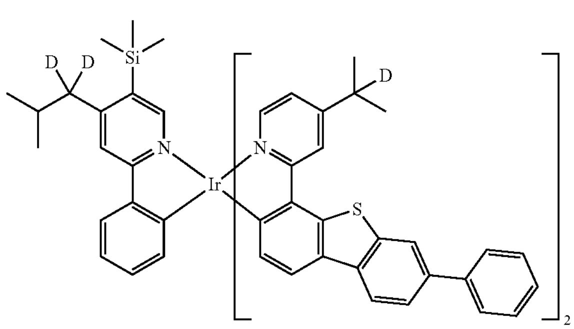
-continued
3224
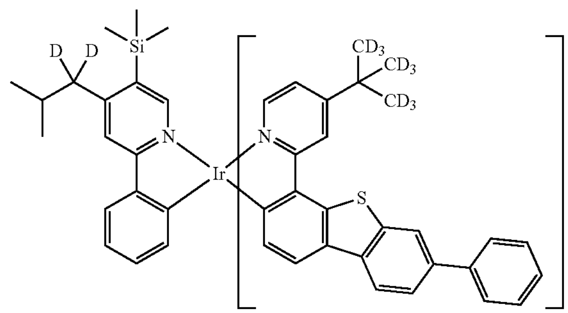
3225
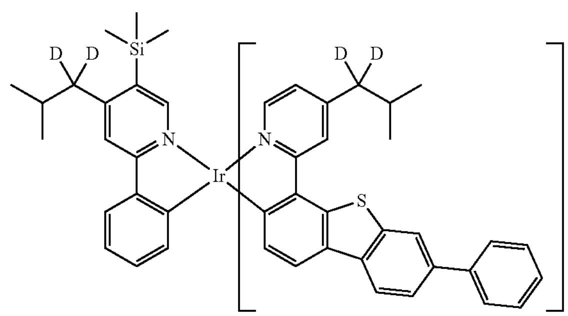
3226
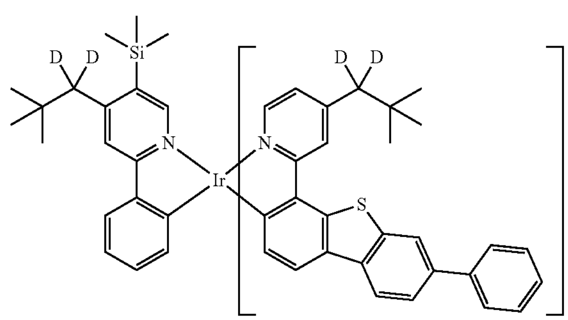
3327
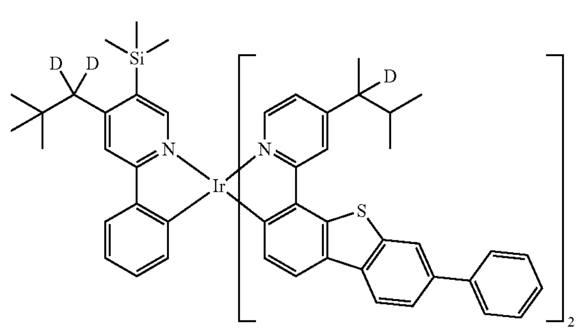

-continued
3328
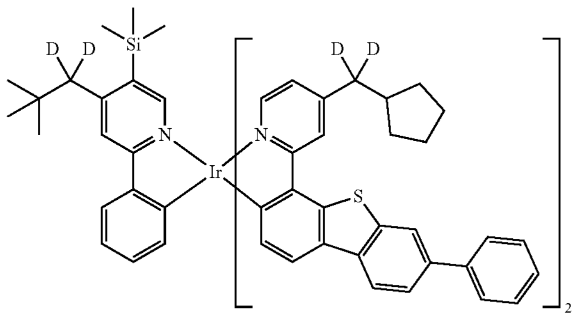
3329
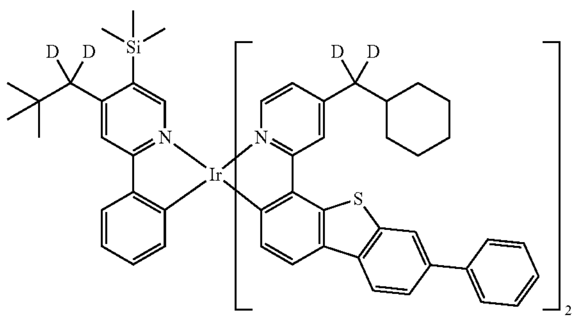
3330
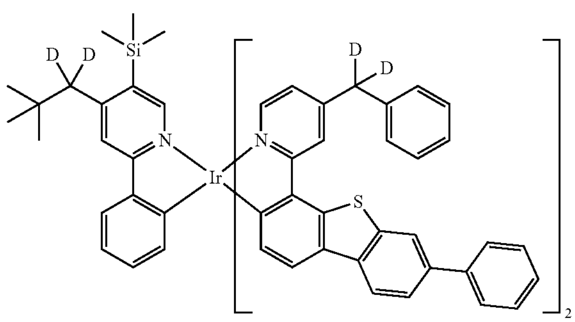
3331
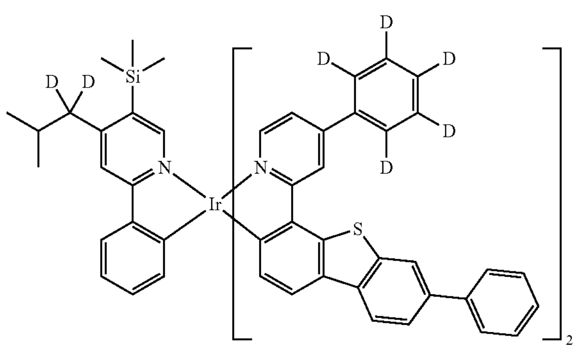
-continued
3332
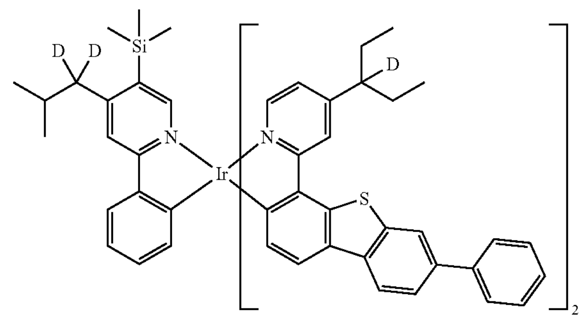
3333
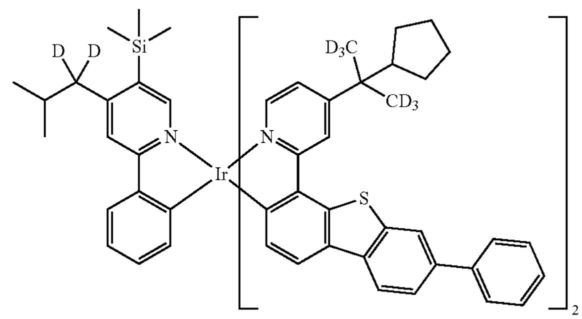
3334
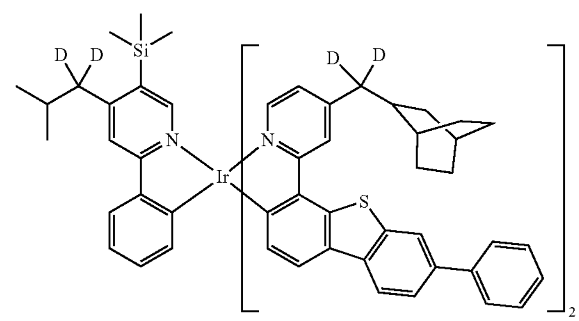
3335
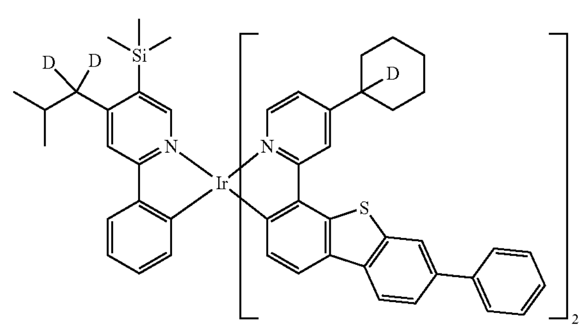

3336
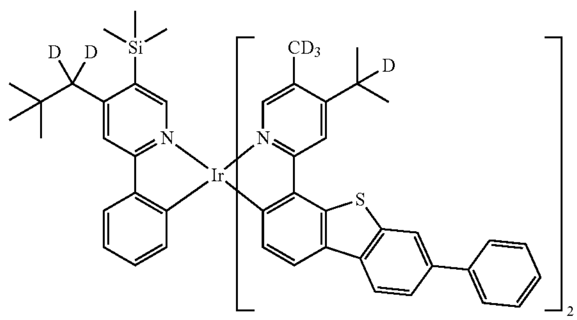
3337
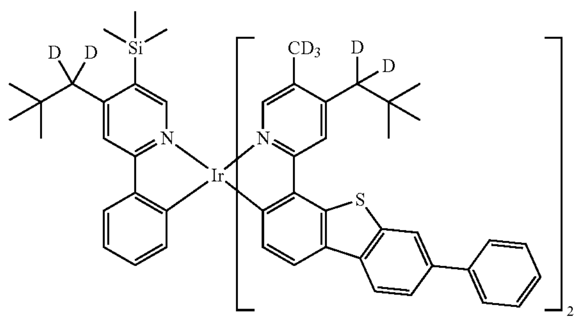
3338
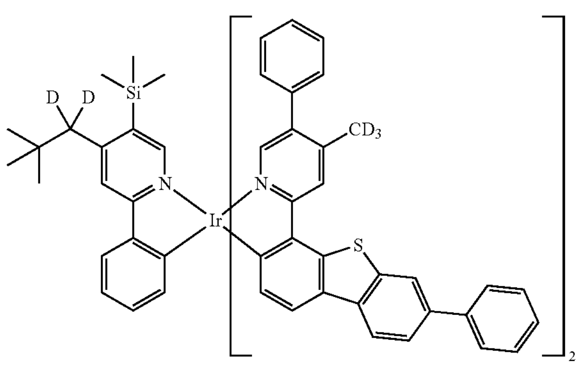
3339
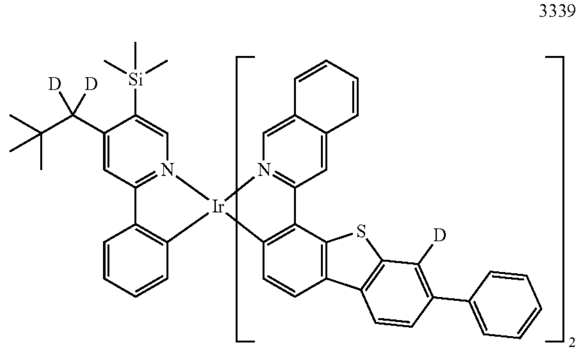
3340
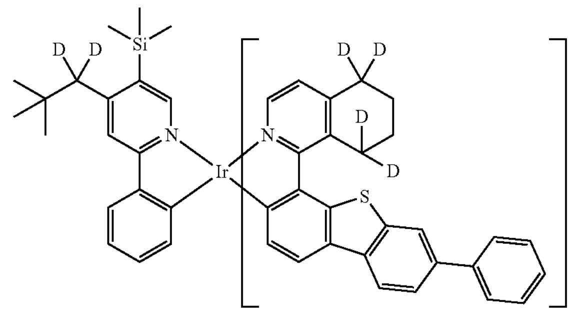
3341
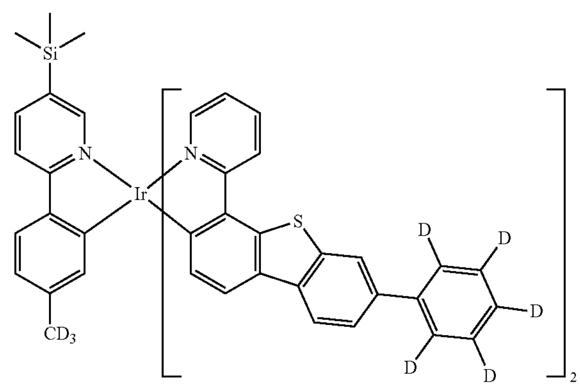
3342
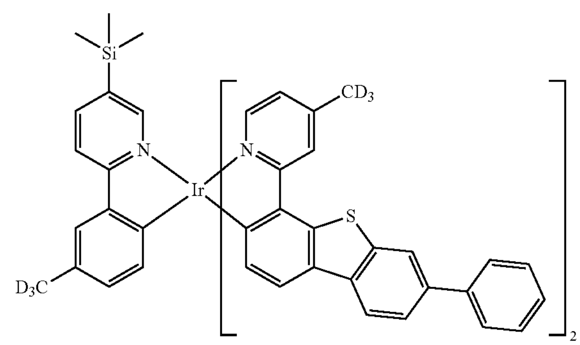
3343
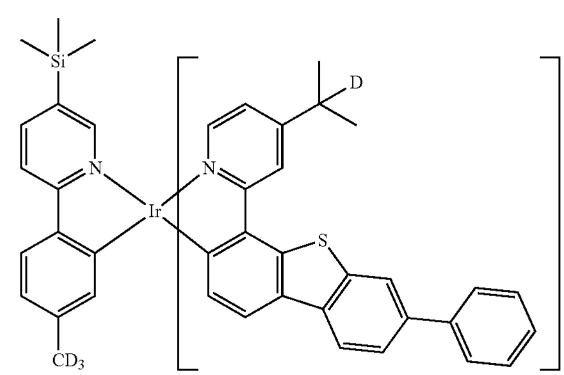

3344
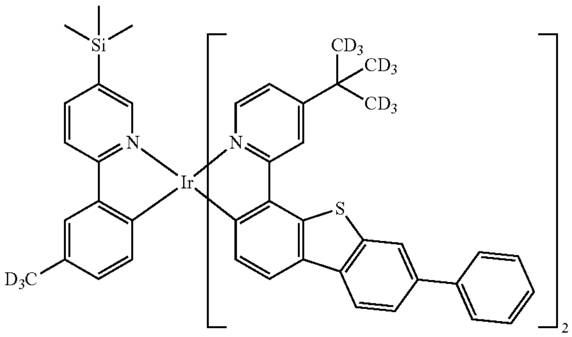
3345
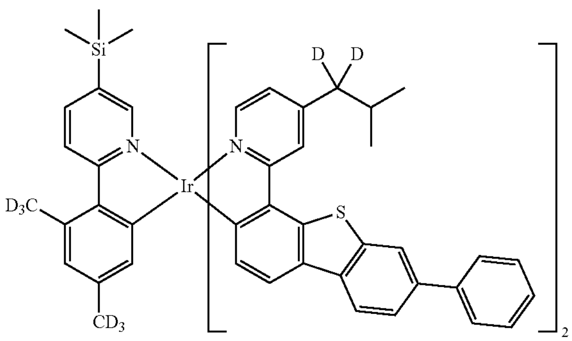
3346
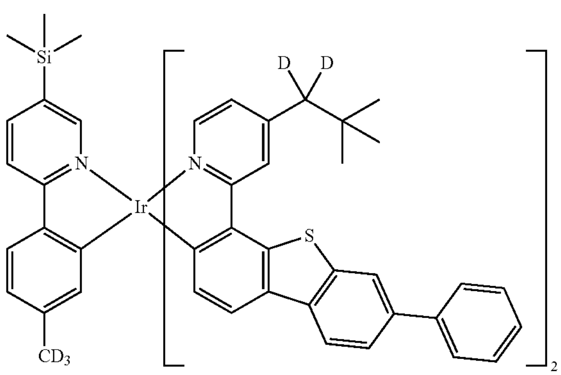
3347
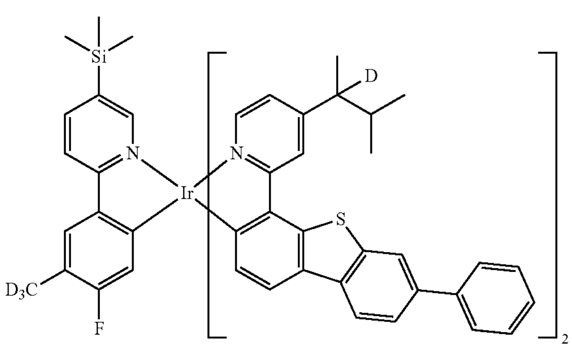
3348
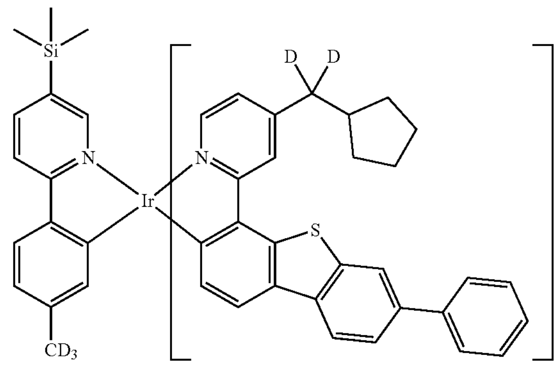
3349
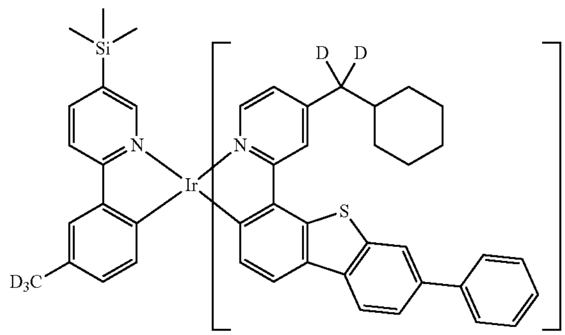
3350
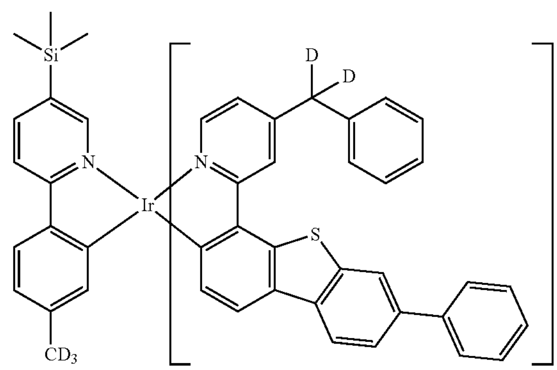
3351
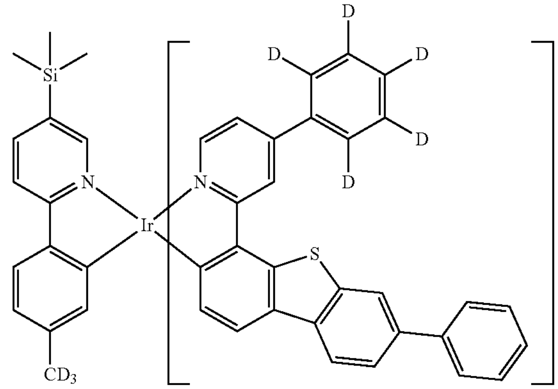

-continued
3352
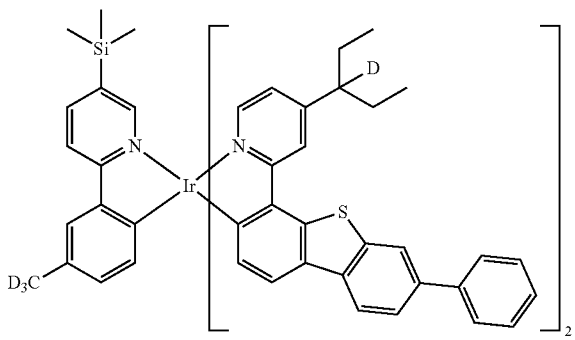
3353
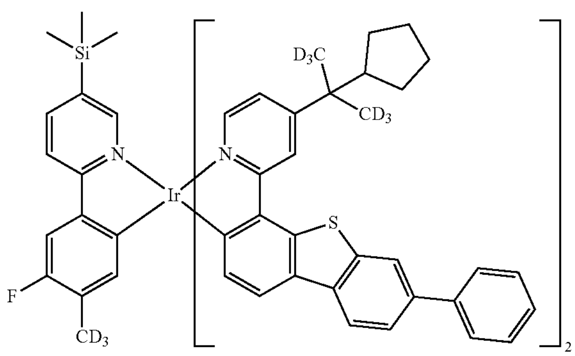
3354
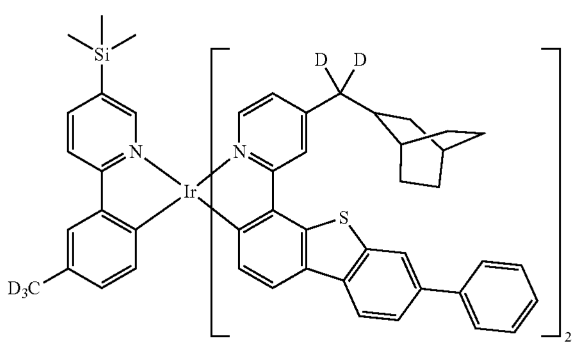
3355
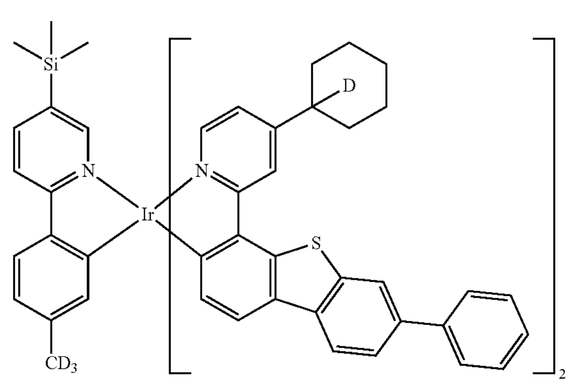
-continued
3356
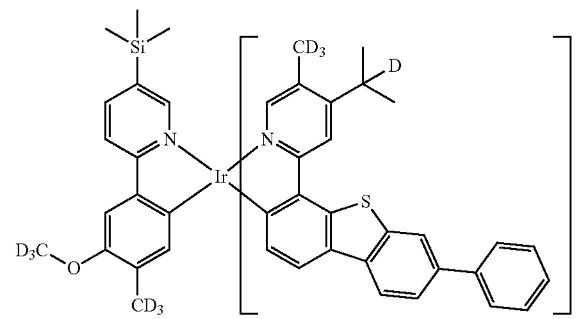
3357
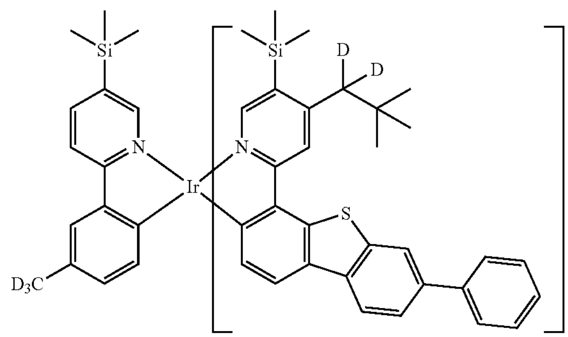
3358
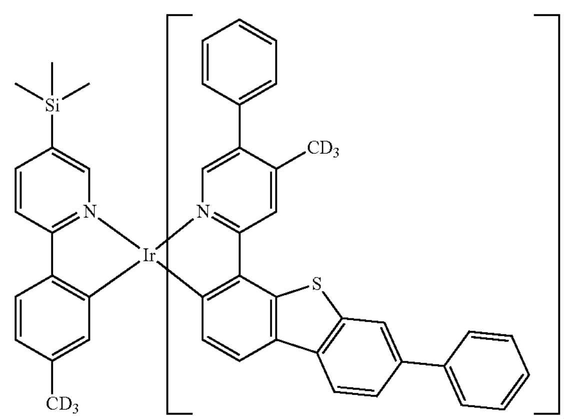
3359
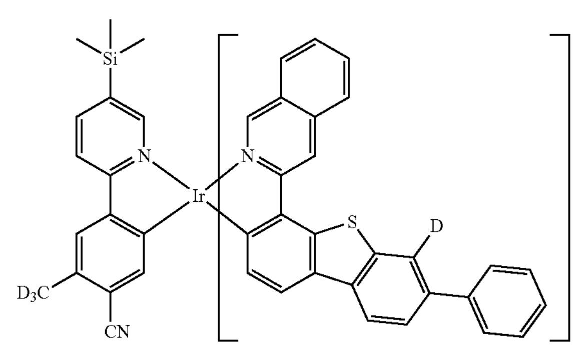

-continued
3360
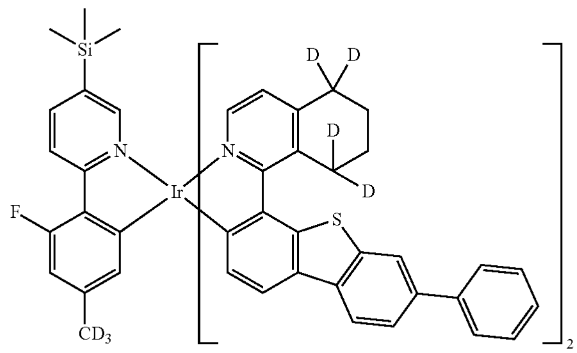
3361
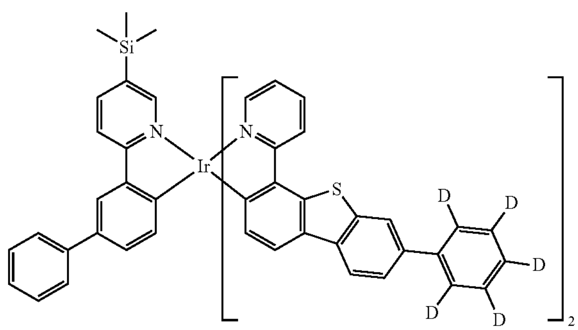
3362
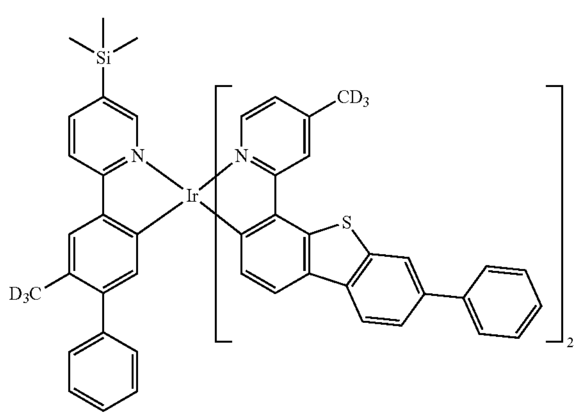
3363
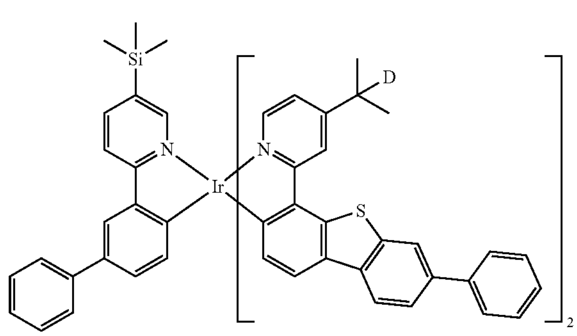
-continued
3364
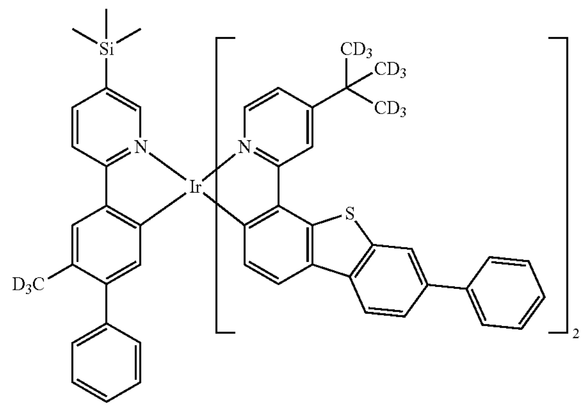
3365
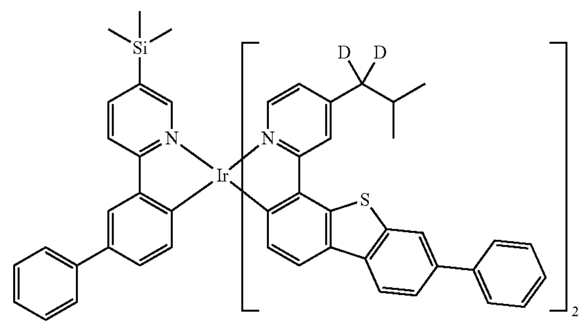
3366
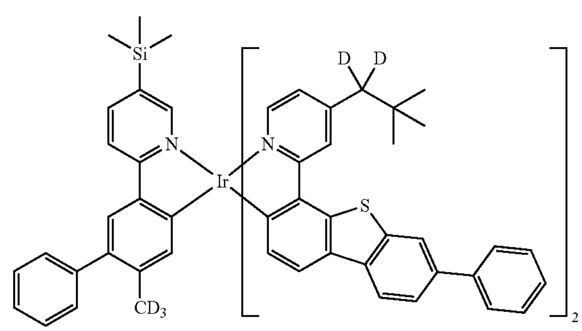
3367
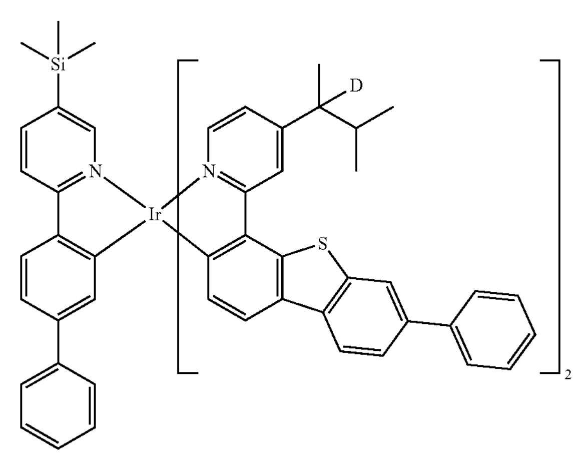

-continued
3368
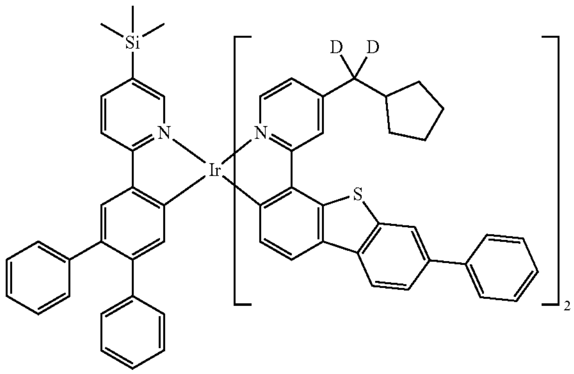
3369
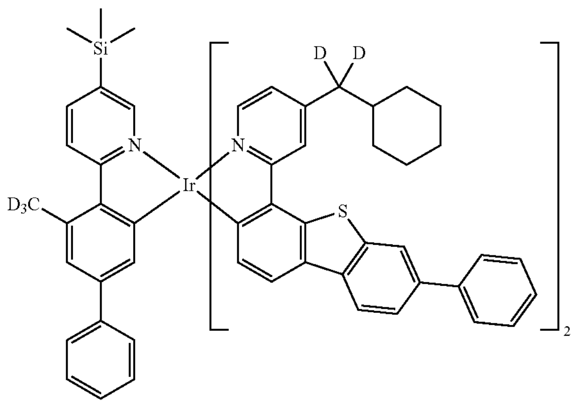
3370
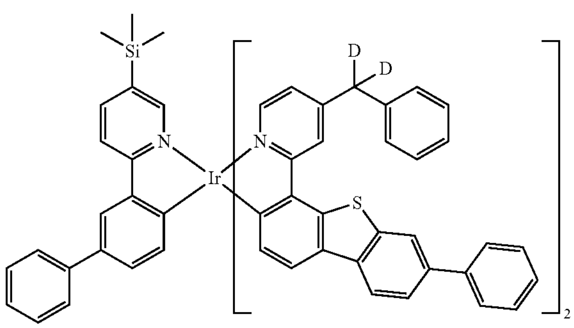
3371
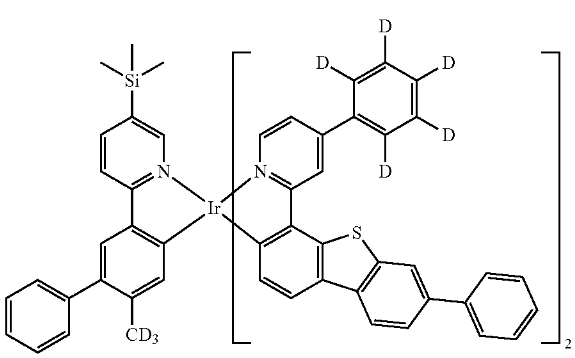
-continued
3372
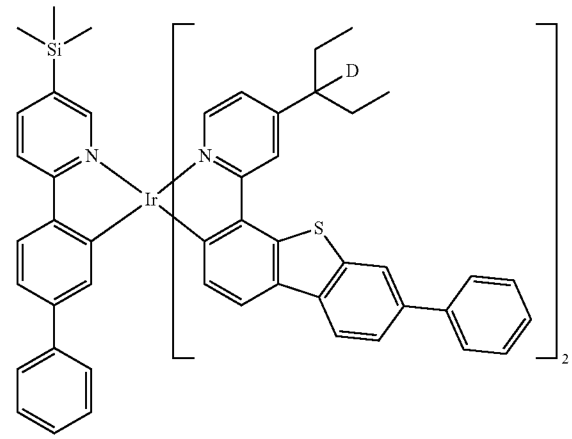
3373
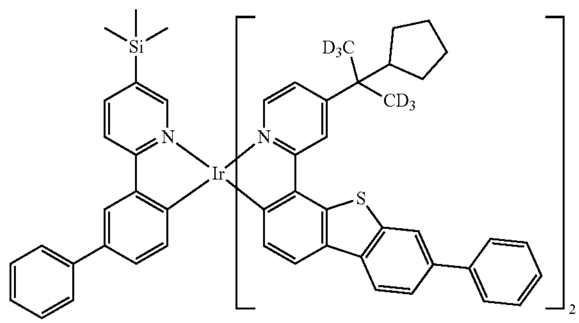
3374
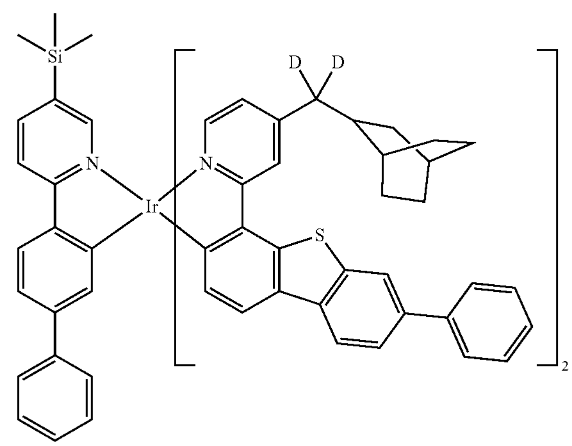
3375
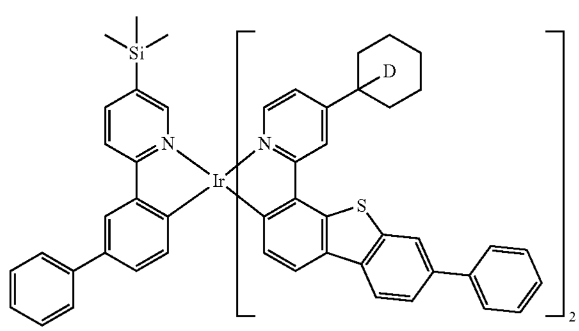

-continued
3376
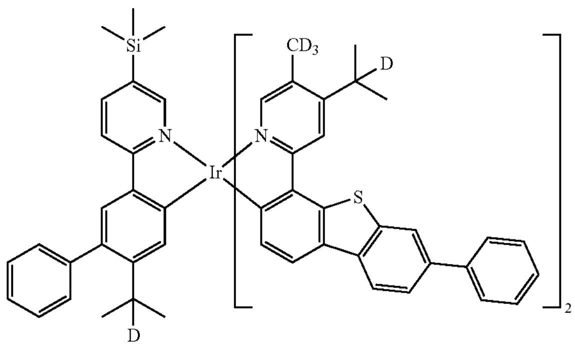
3377
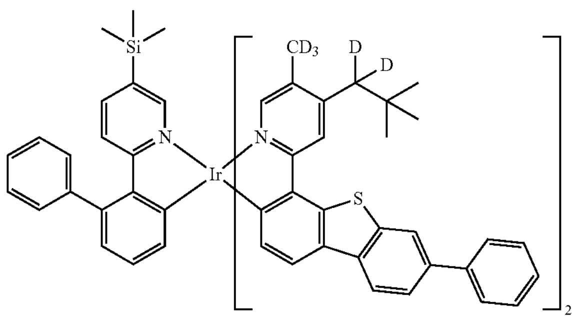
3378
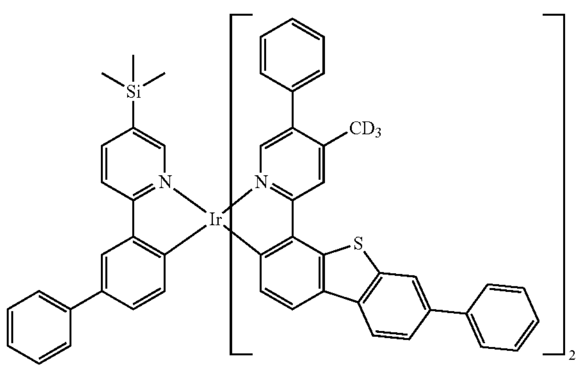
3379
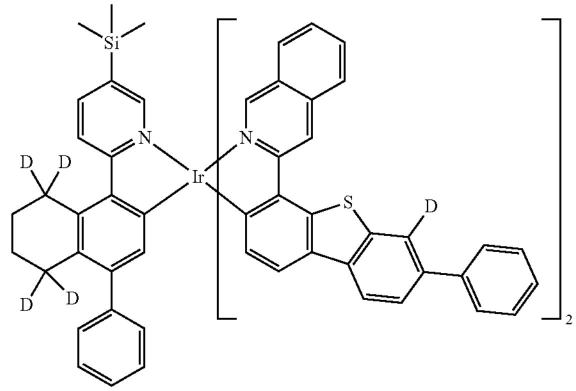
-continued
3380
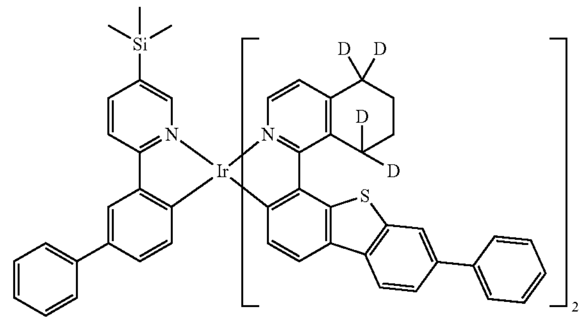
3381
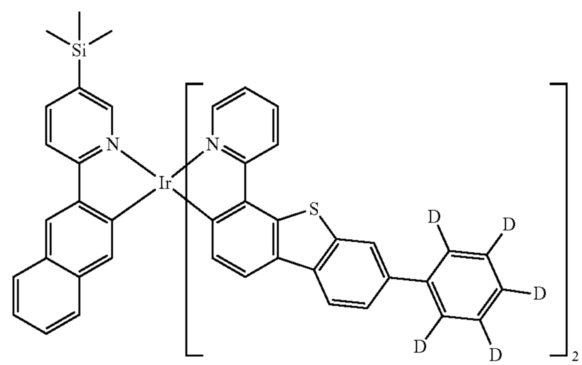
3382
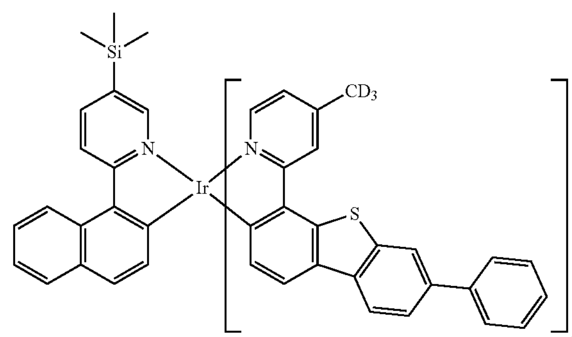
3383
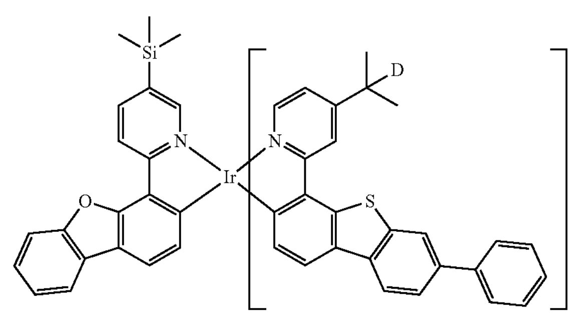

-continued
3384
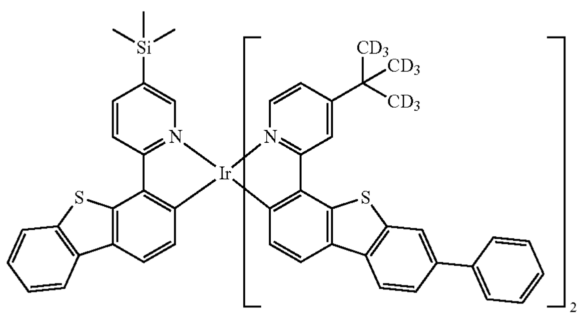
3385
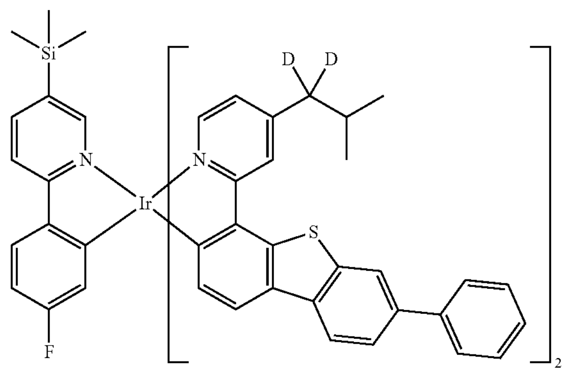
3386
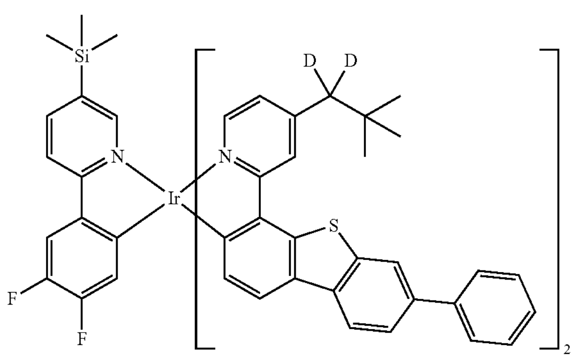
3387
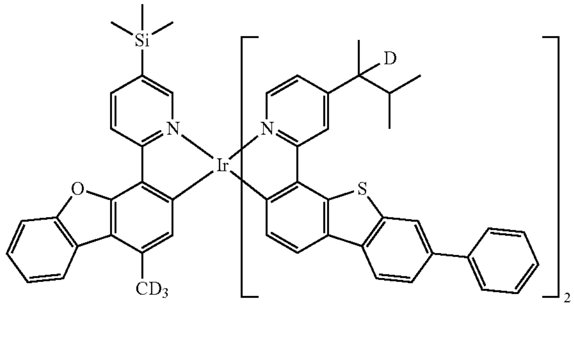
-continued
3388
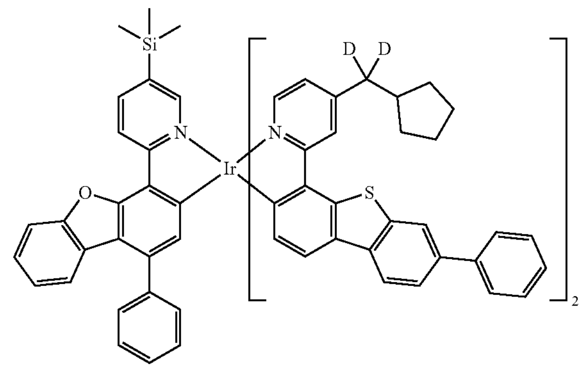
3389
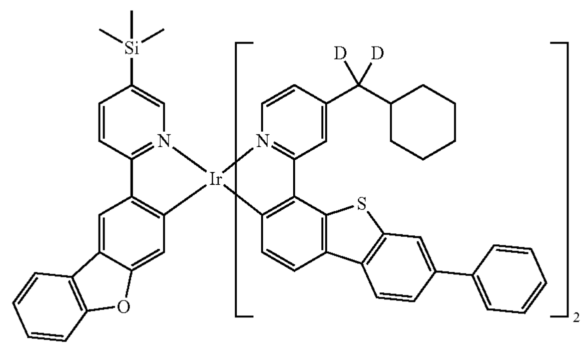
3390
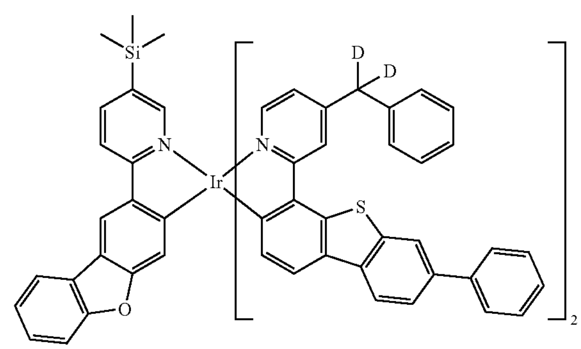
3391
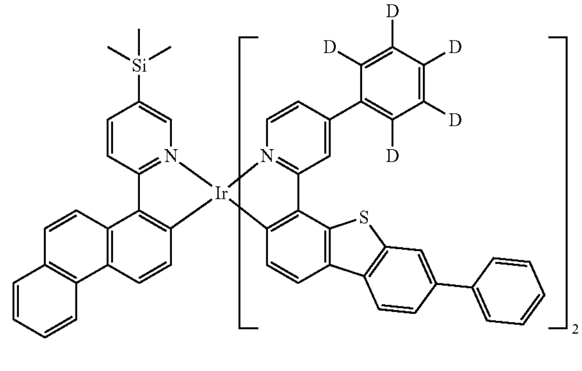

3392
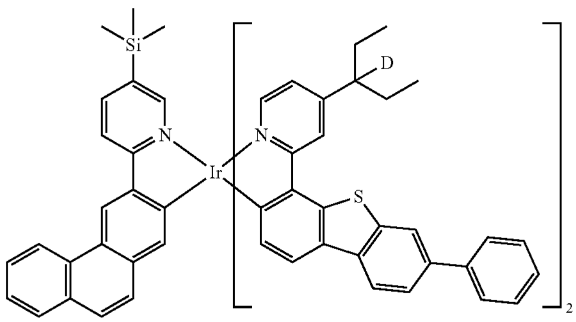
3393
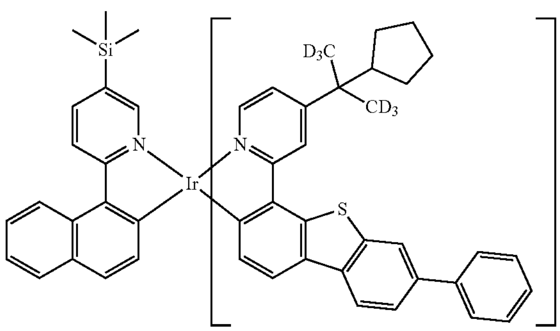
3394
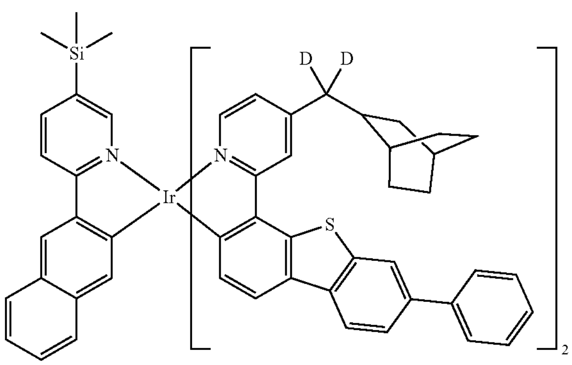
3395
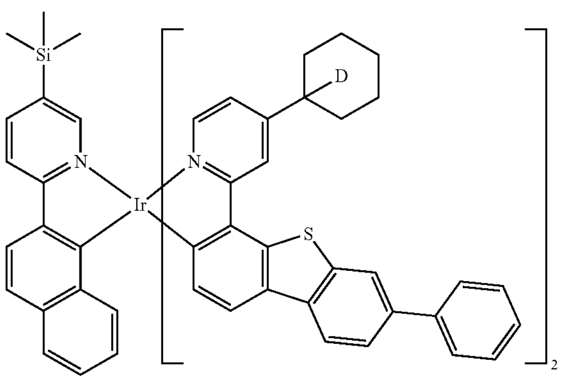
3396
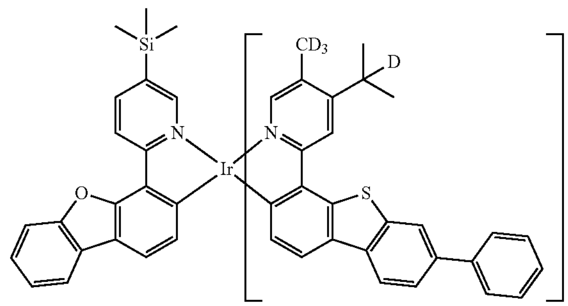
3397
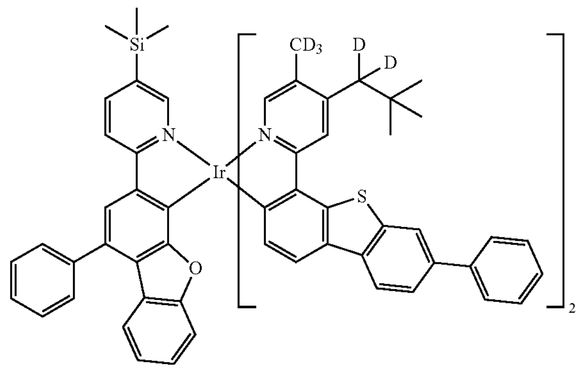
3398
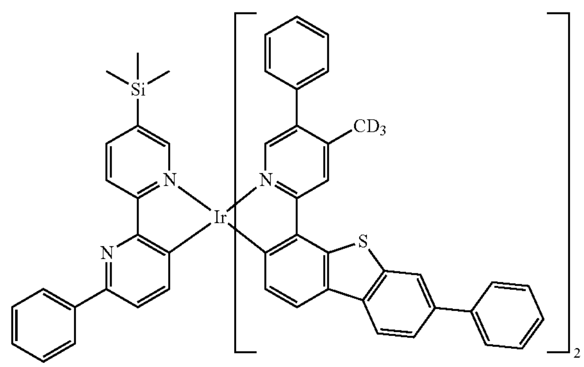
3399
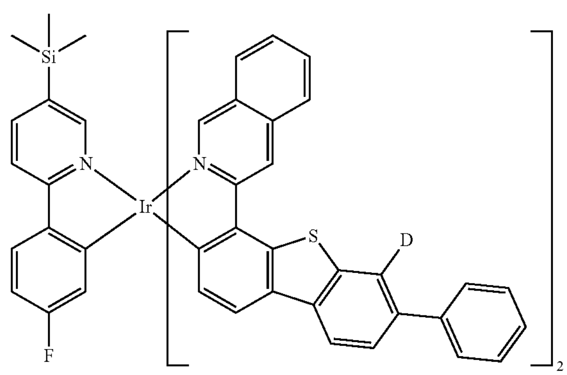

-continued
3400
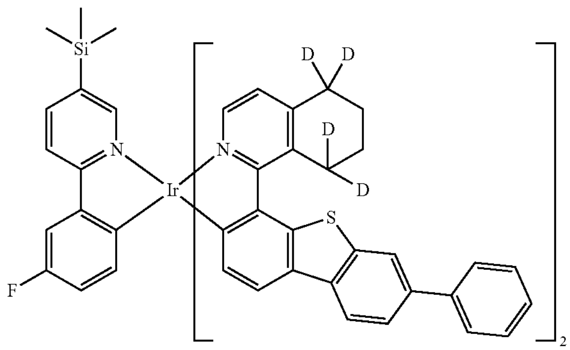
3401
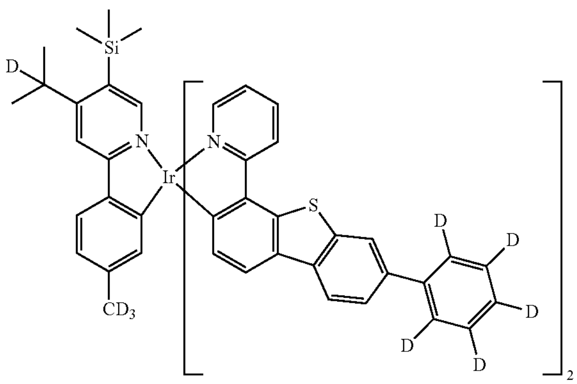
3402
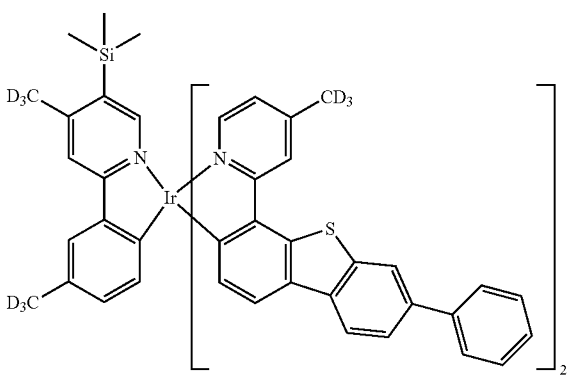
3403
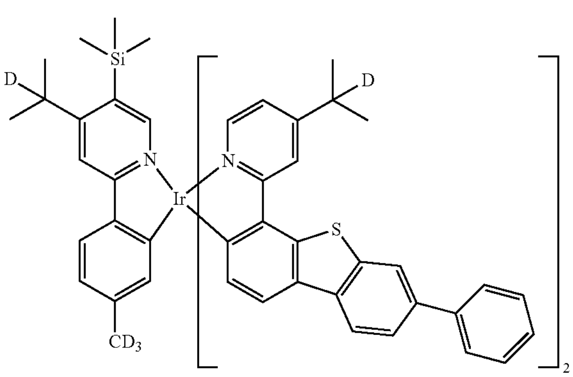
-continued
3404
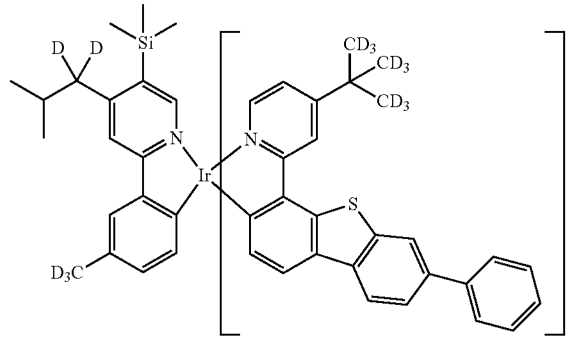
3405
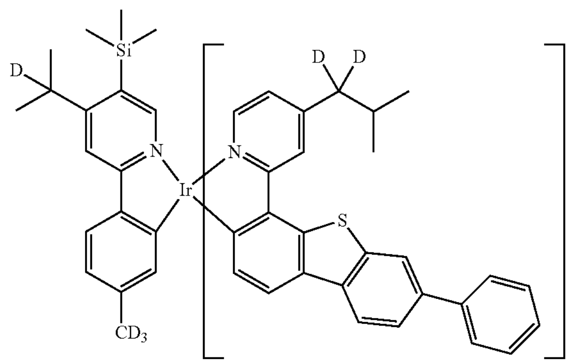
3406
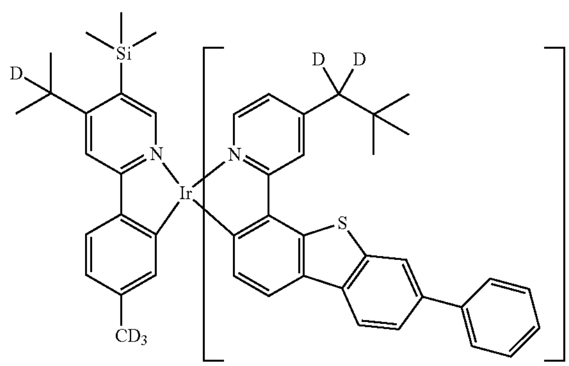
3407
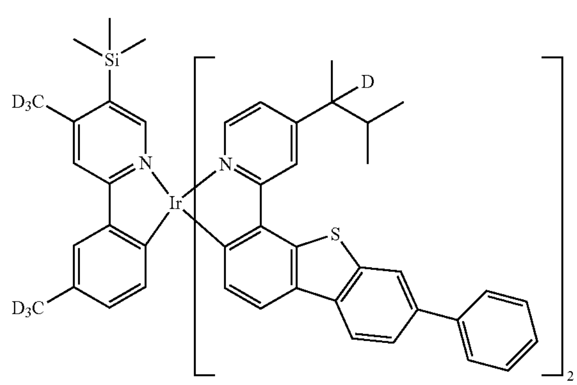

-continued
3408
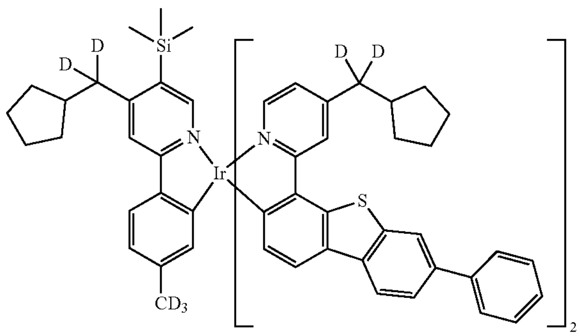
3409
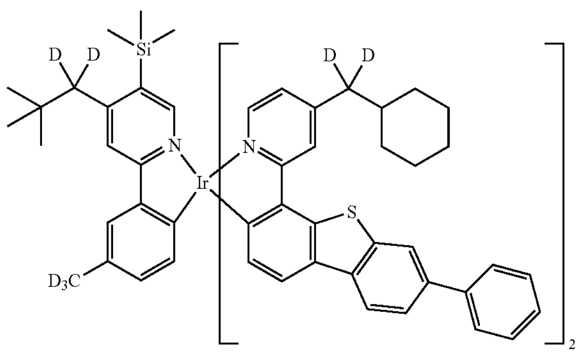
3410
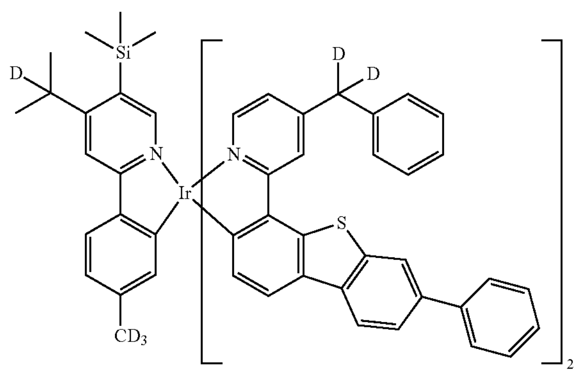
3411
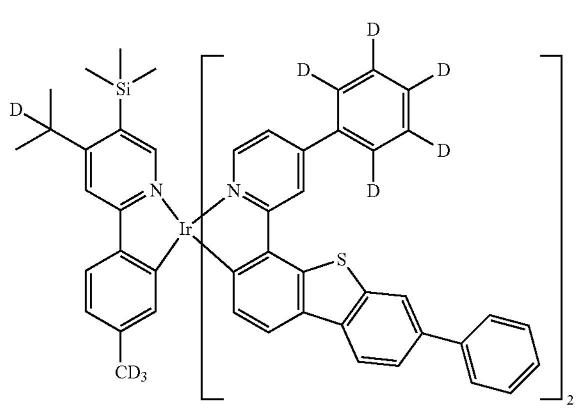
-continued
3412
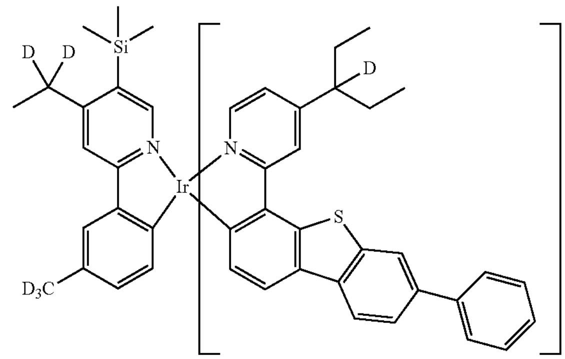
3413
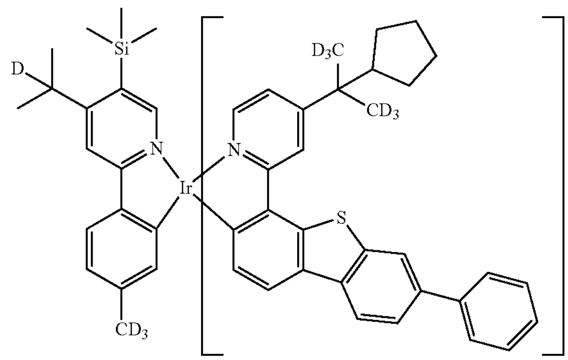
3414
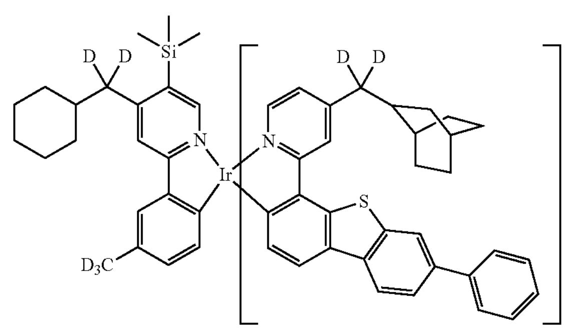
3415
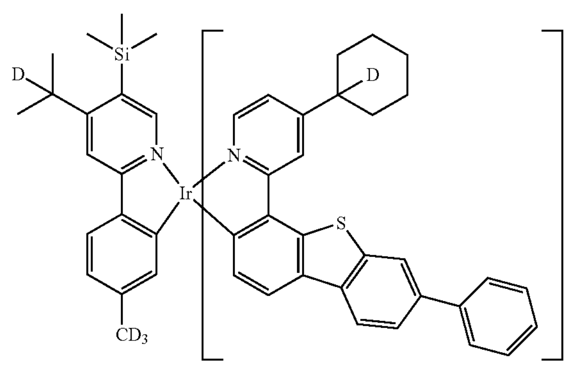

3416
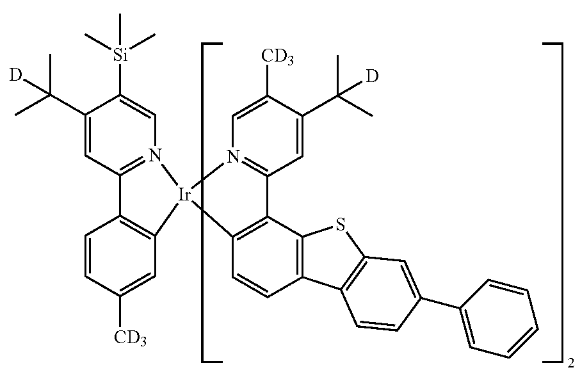
3417
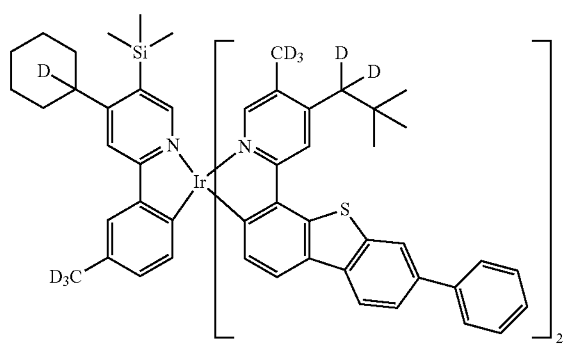
3418
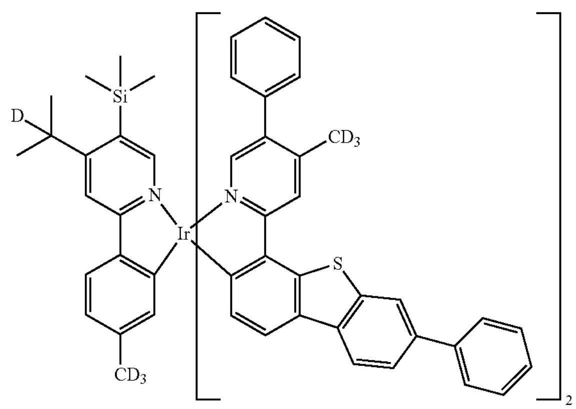
3419
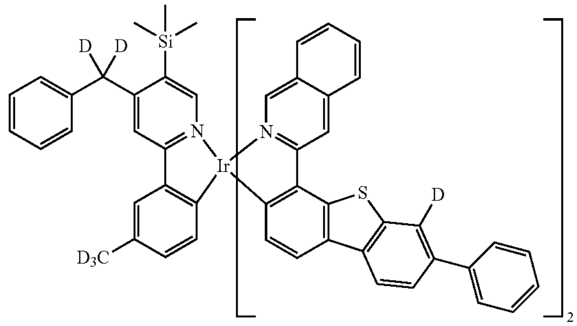
3420
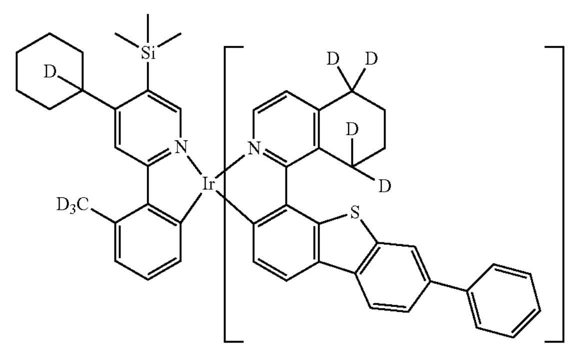
3421
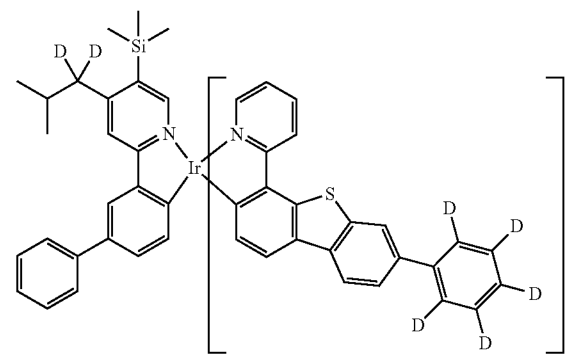
3422
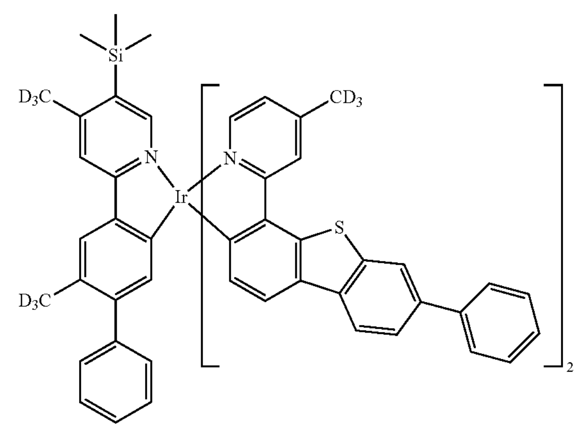
3423
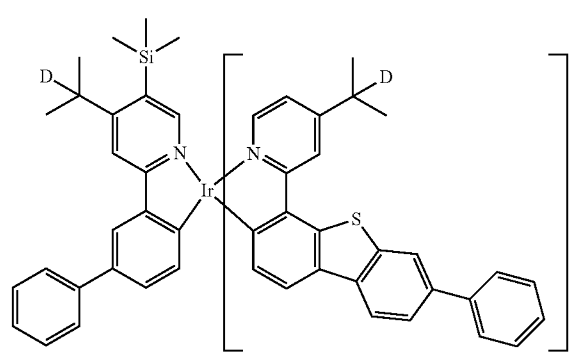

-continued
3424
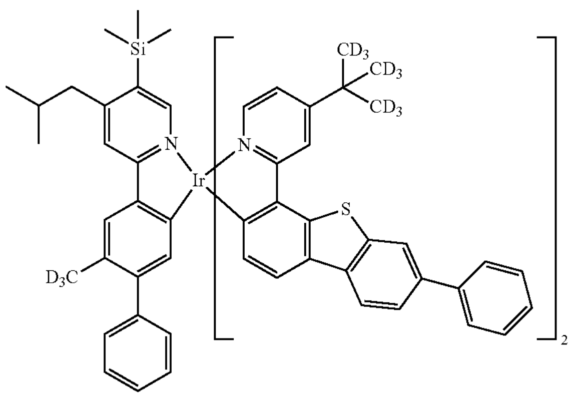
3425
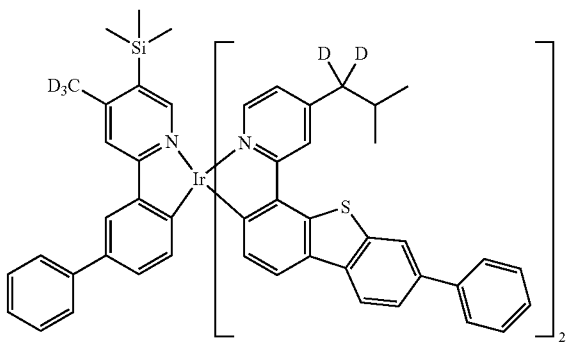
3426
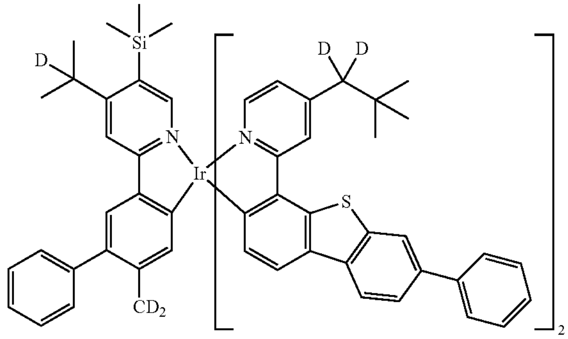
3427
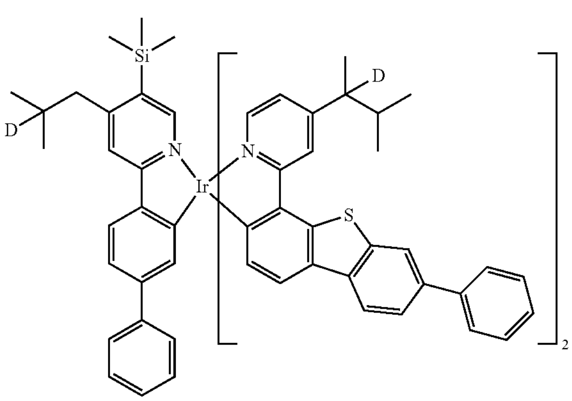
-continued
3428
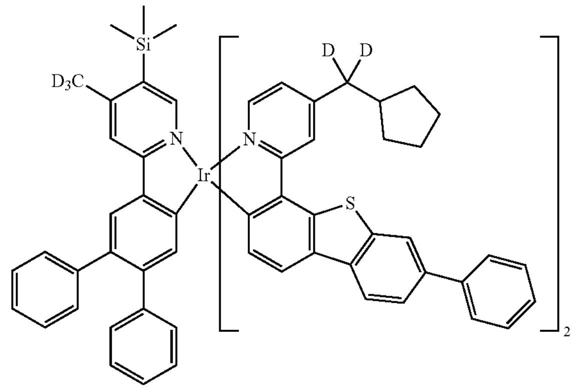
3429
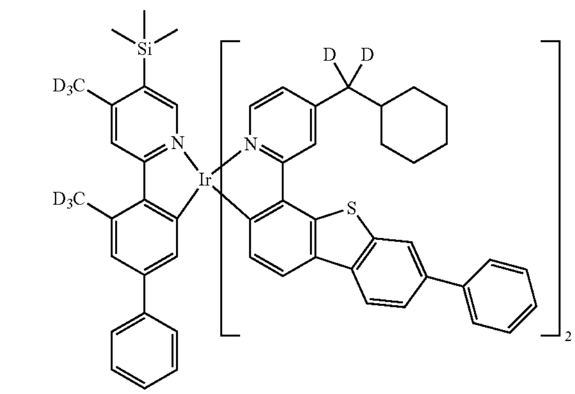
3430
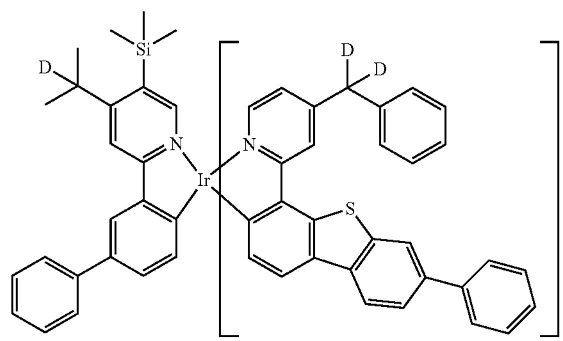
3431
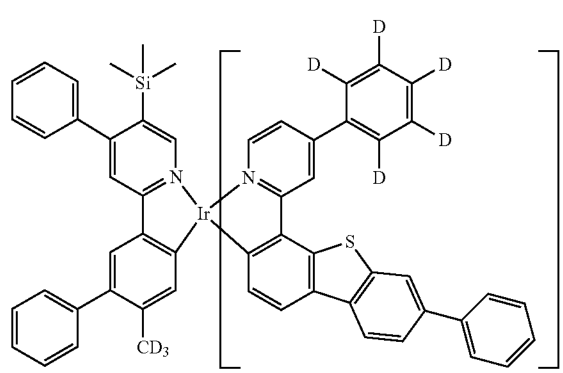

-continued
3432
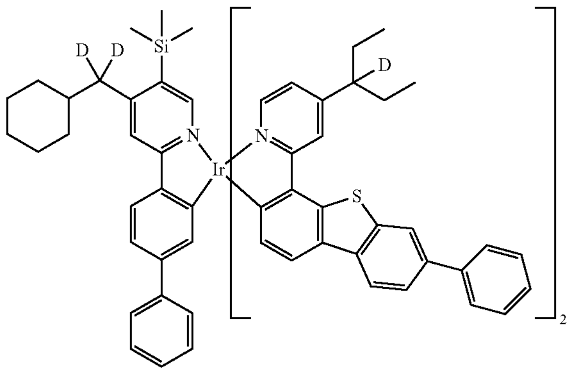
3433
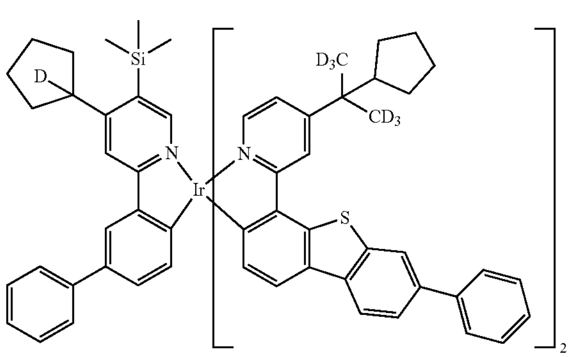
3434
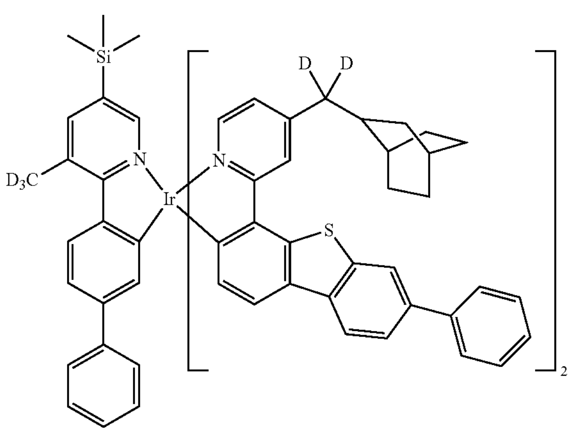
3435
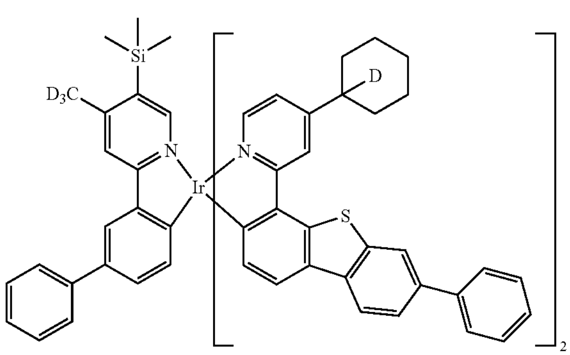
-continued
3436
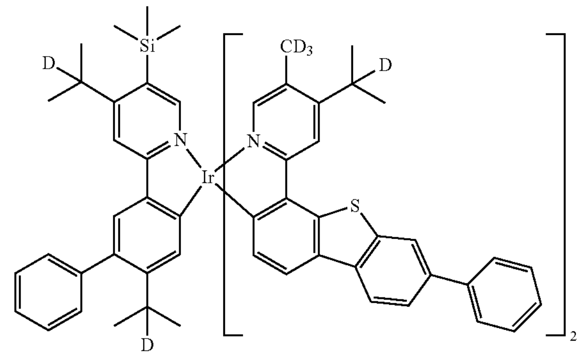
3437
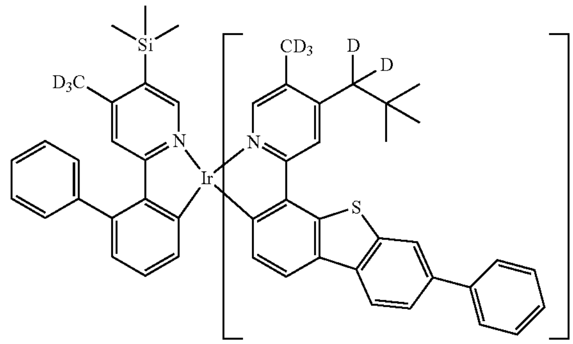
3438
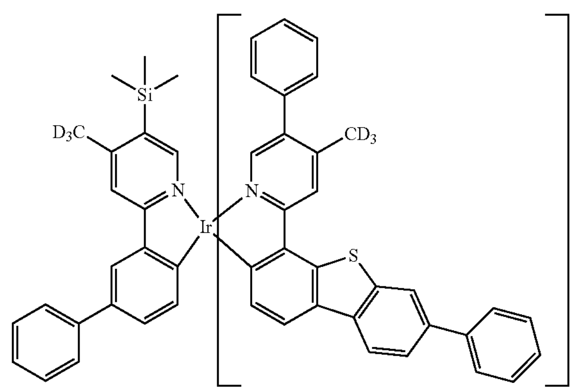
3439
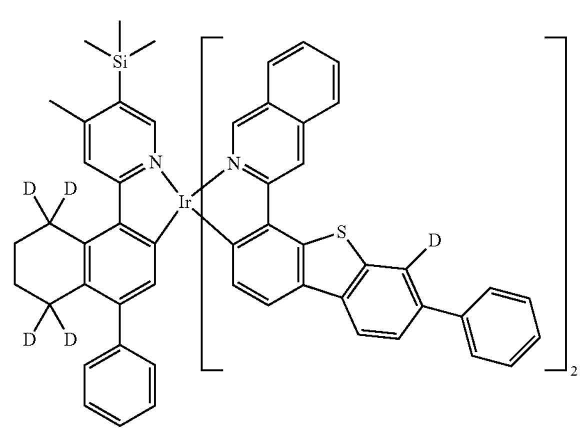

3440
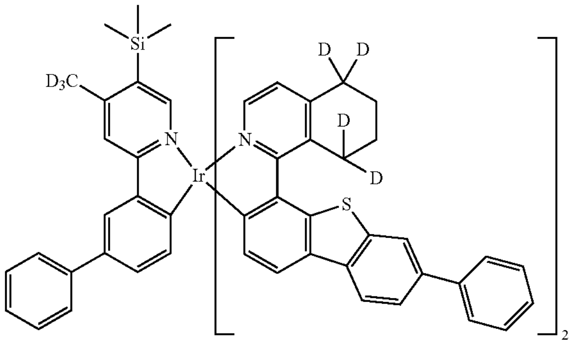
3441
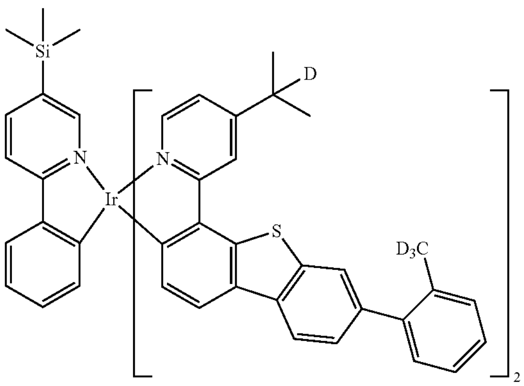
3442
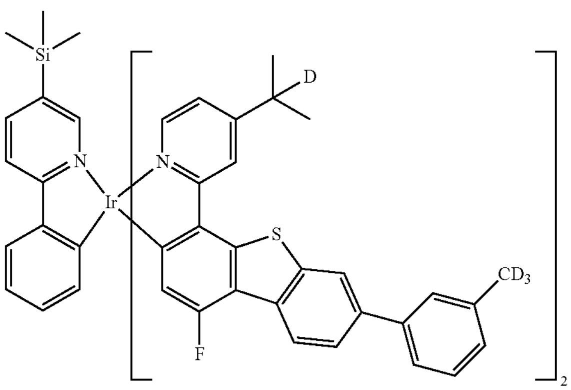
3443
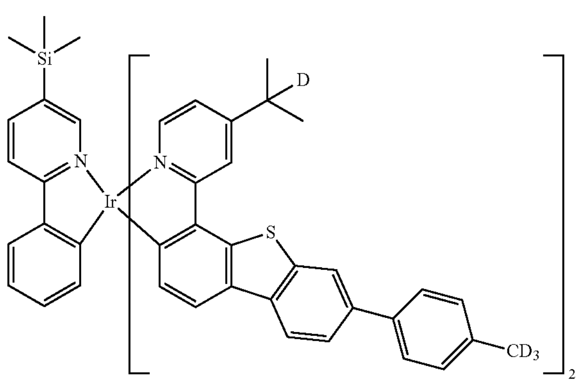
3444
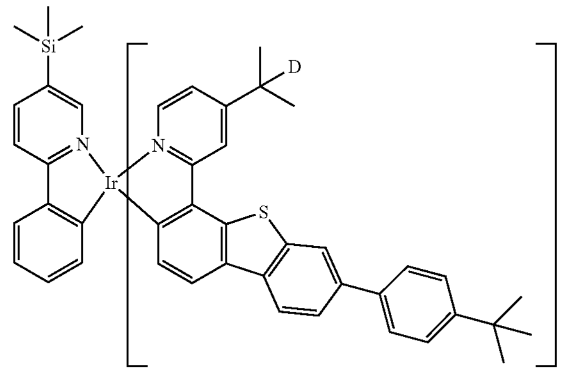
3445
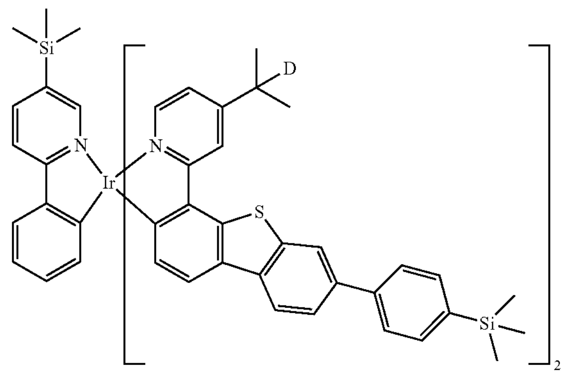
3446
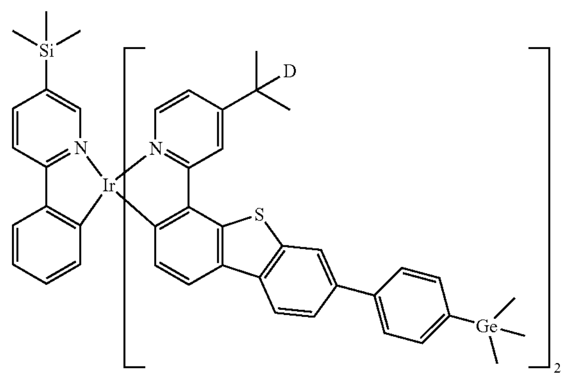
3447
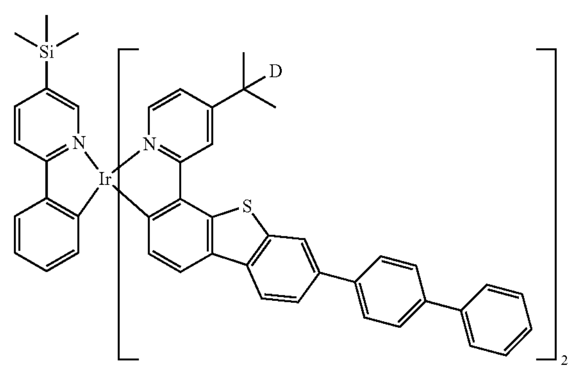

-continued
3448
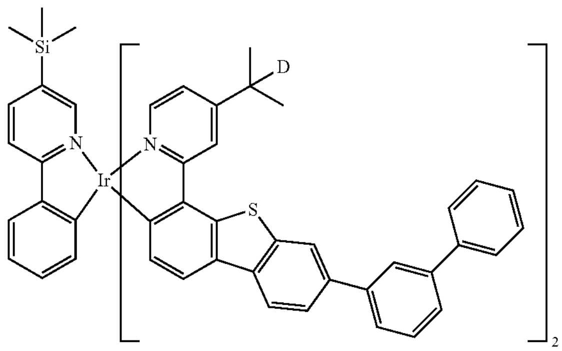
3449
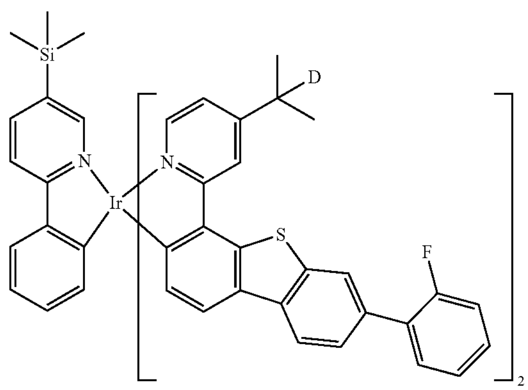
3450
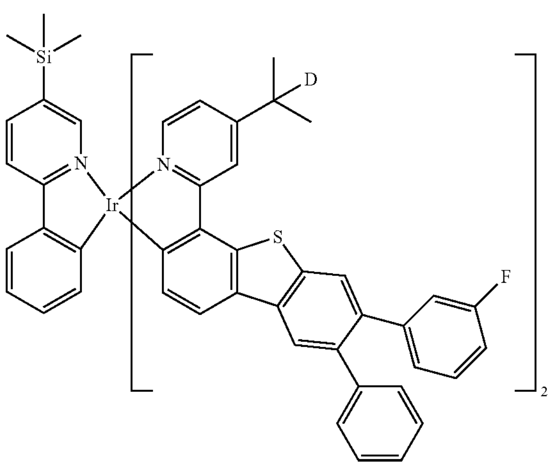
3451
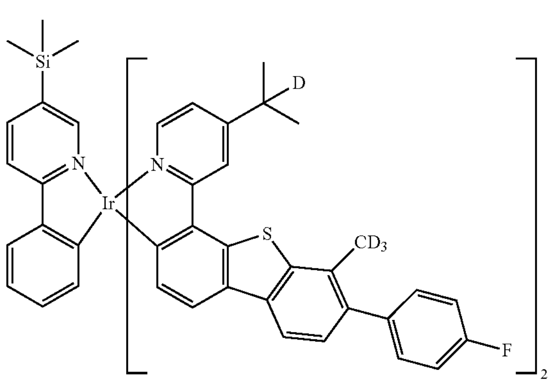
-continued
3452
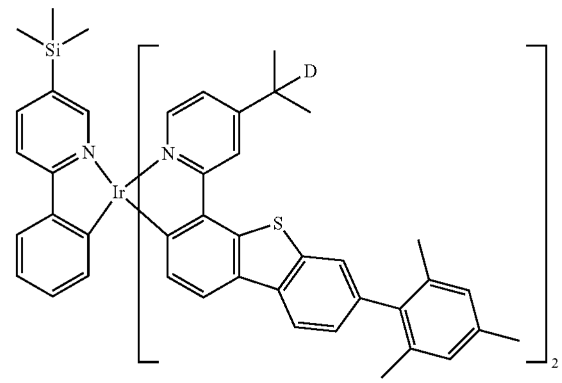
3453
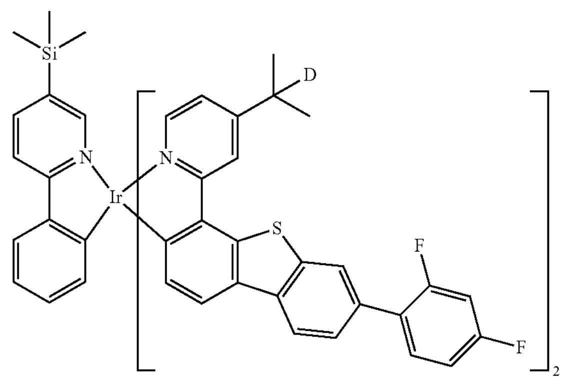
3454
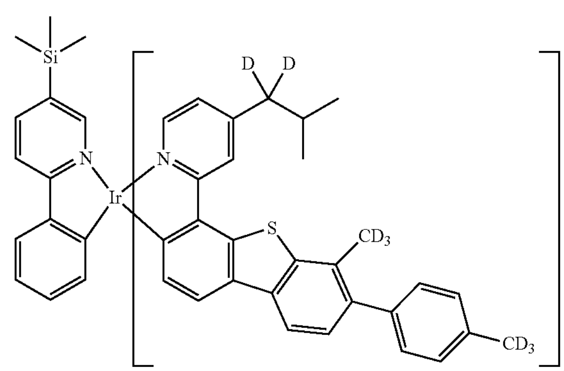
3455
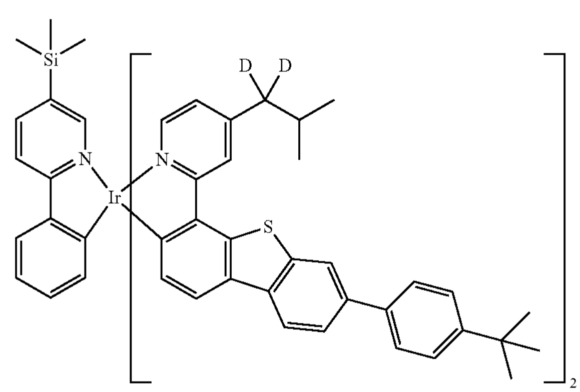

3456
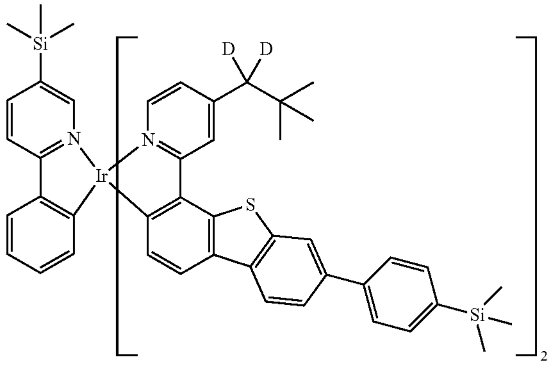
3457
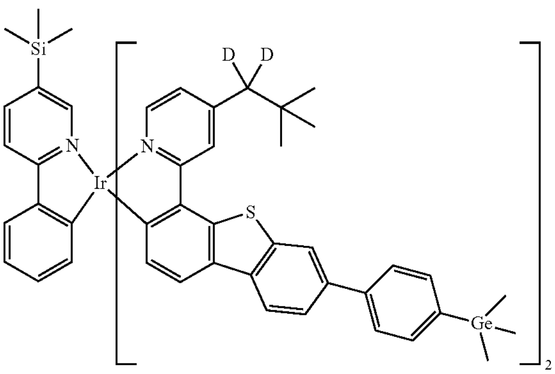
3458
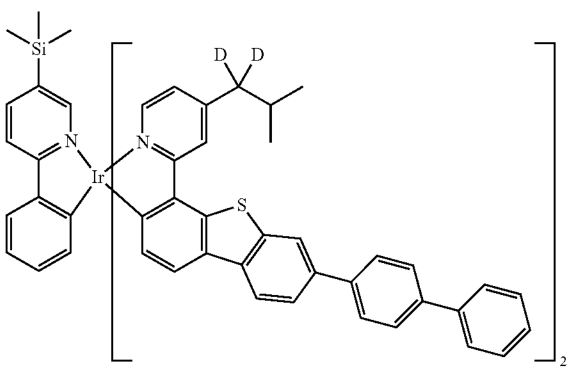
3459
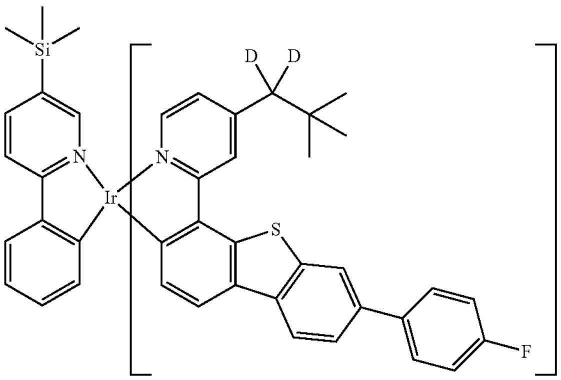
3460
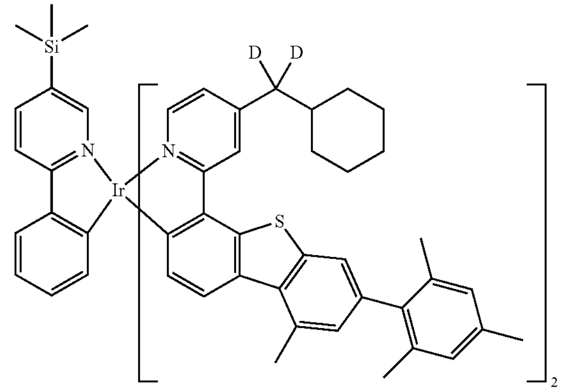
3461
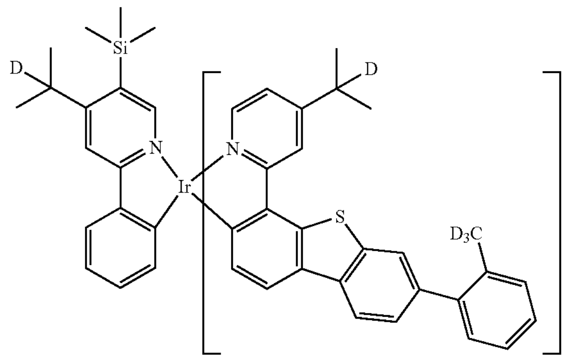
3462
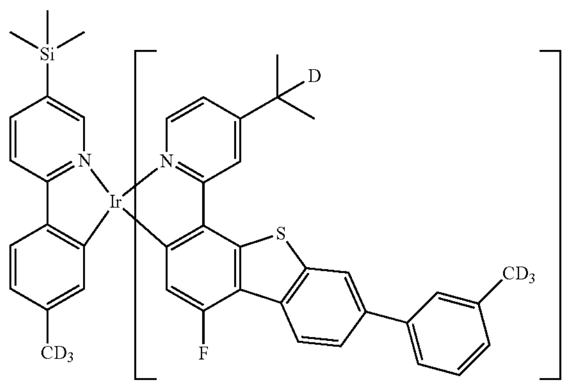
3463
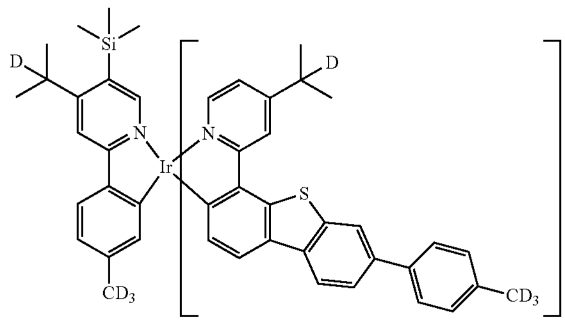

-continued
3464
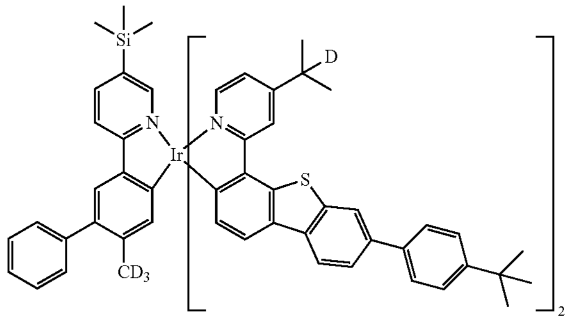
3465
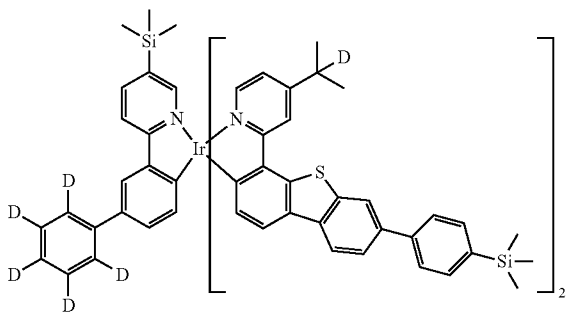
3466
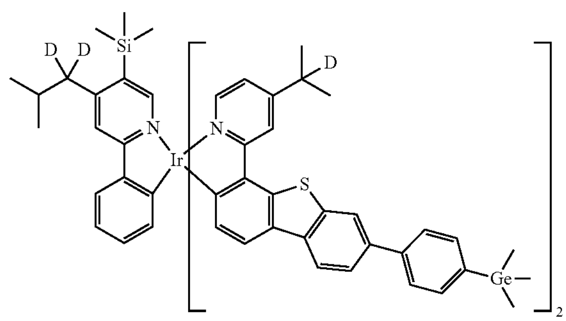
3467
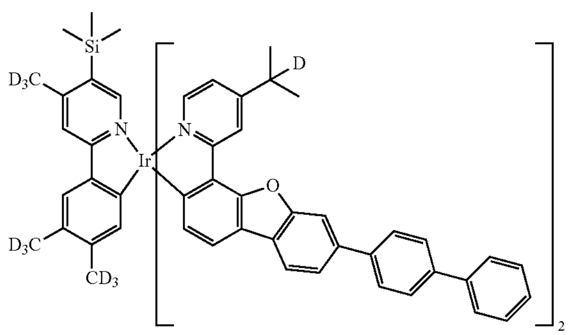
-continued
3468
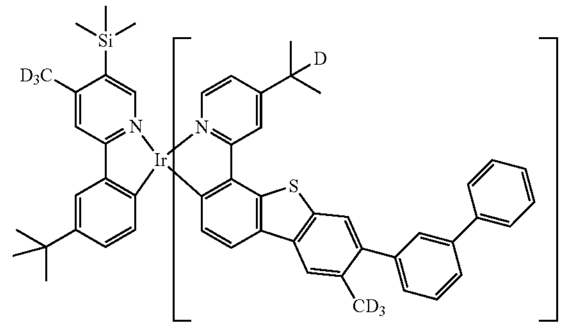
3469
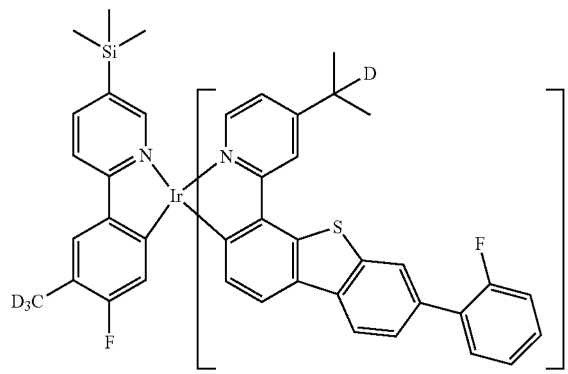
3470
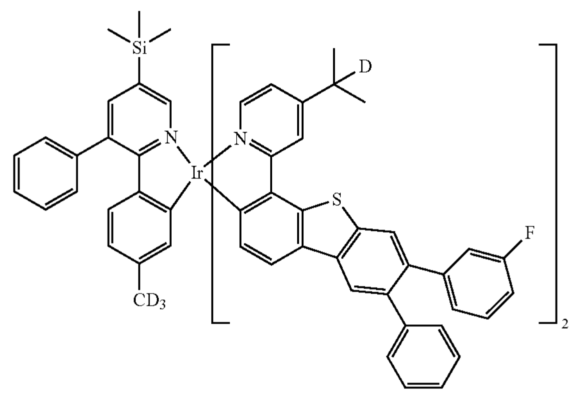
3471
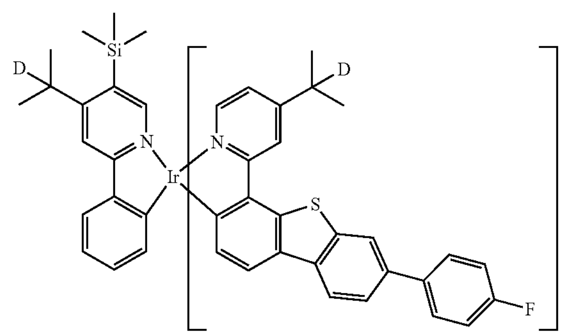

-continued
3472
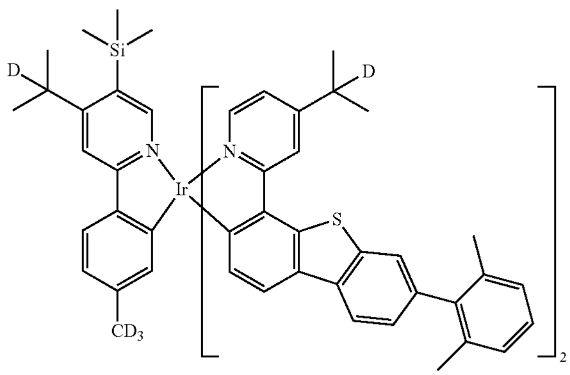
3473
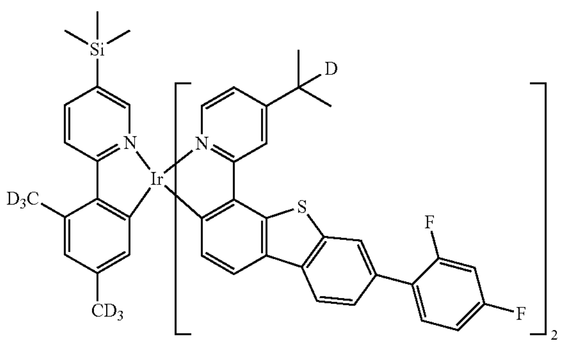
3474
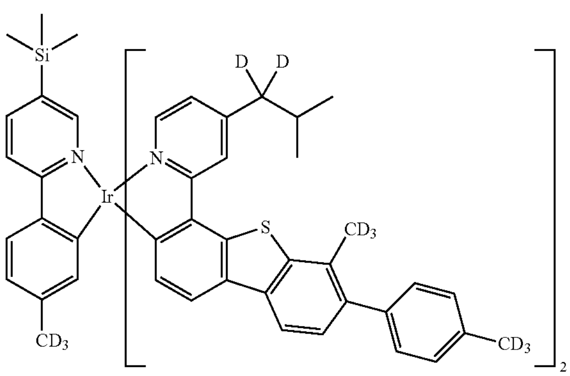
3475
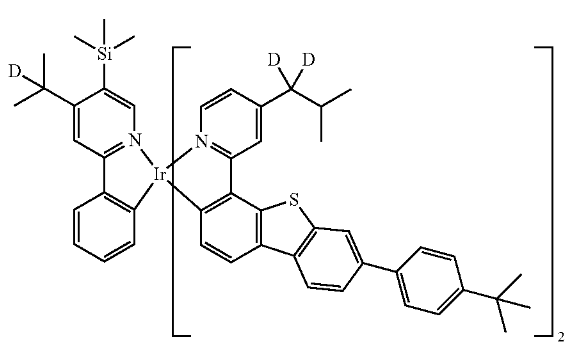
-continued
3476
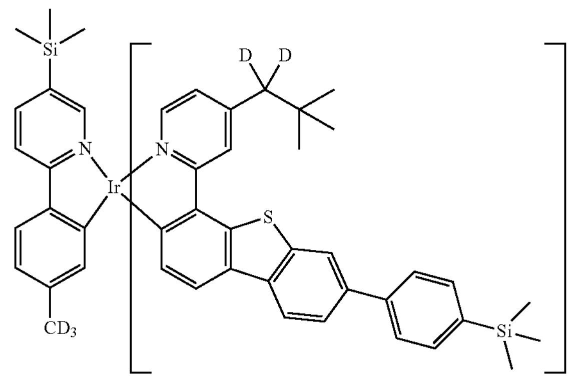
3477
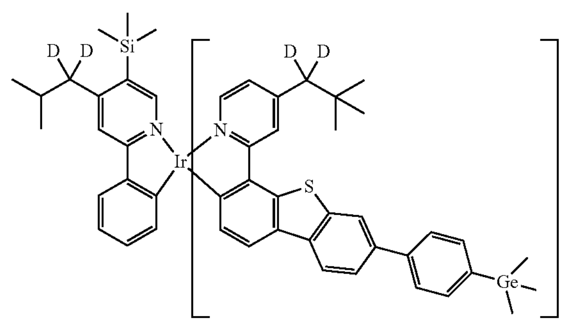
3478
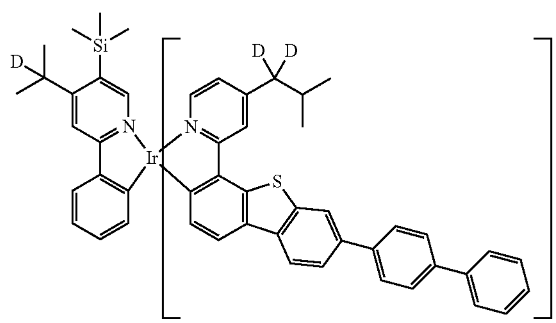
3479
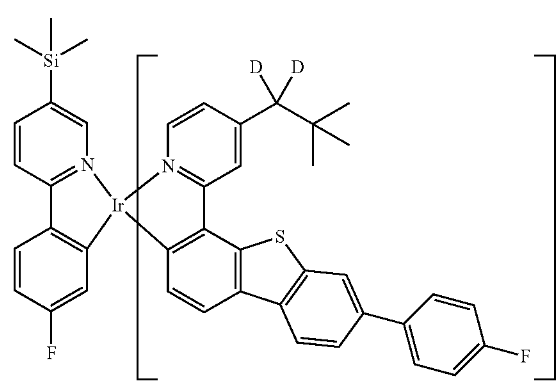

-continued
3480
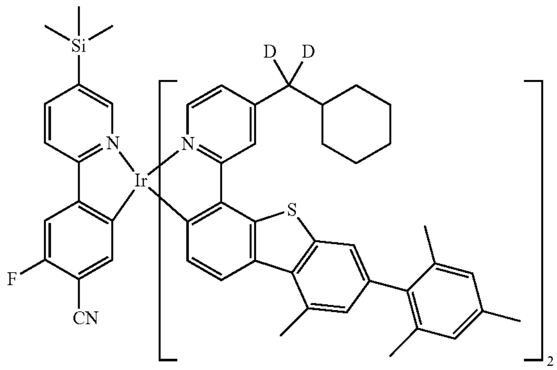
3481
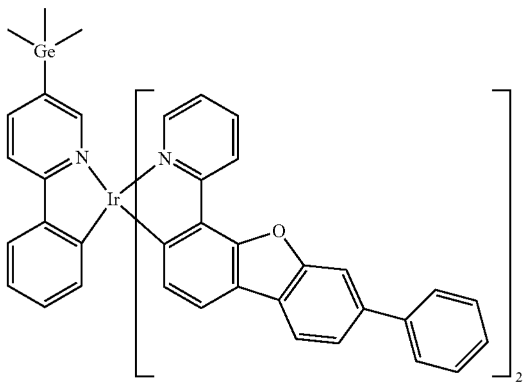
3482
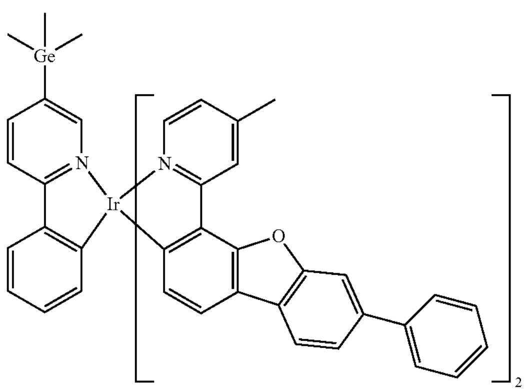
3483
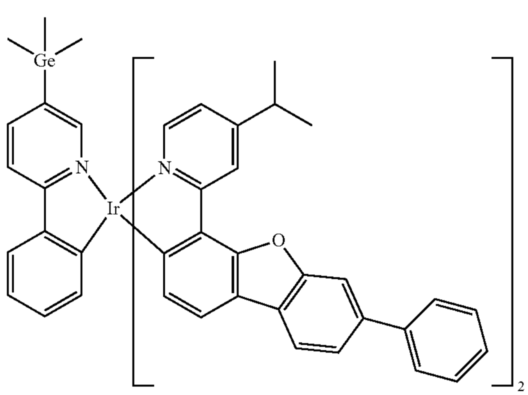
-continued
3484
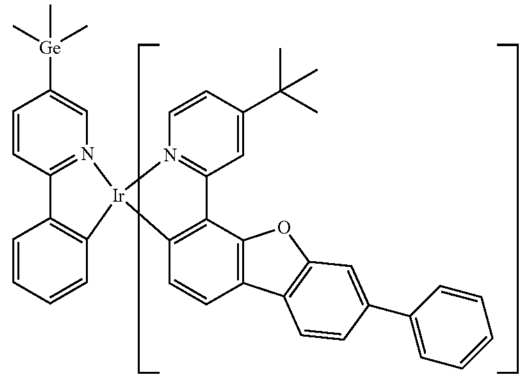
3485
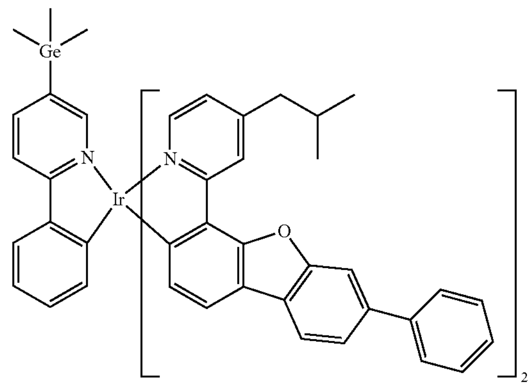
3486
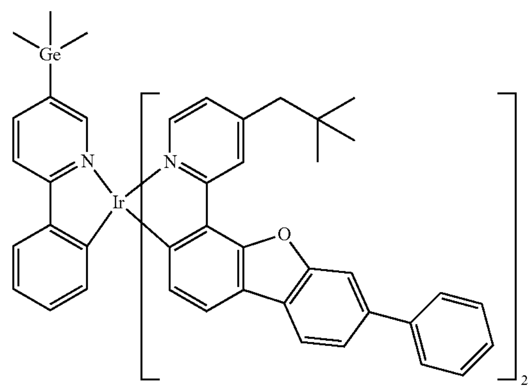
3487
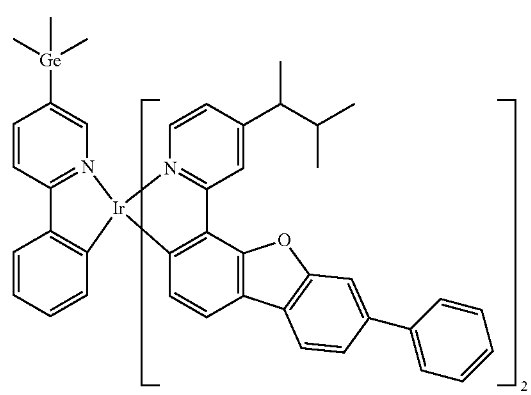

-continued
3488
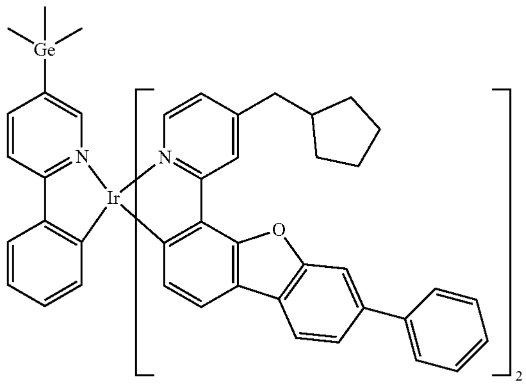
3489
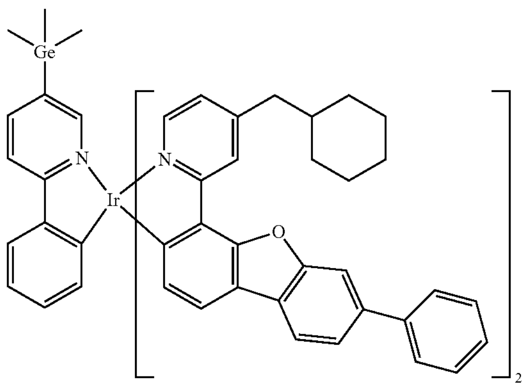
3490
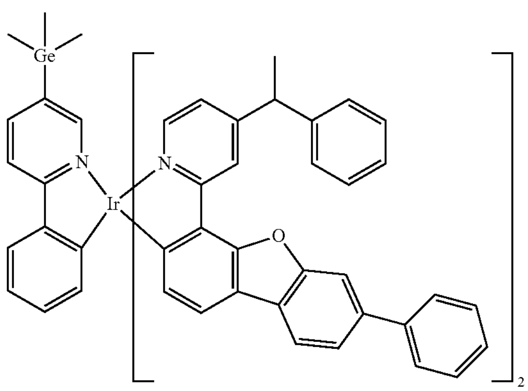
3491
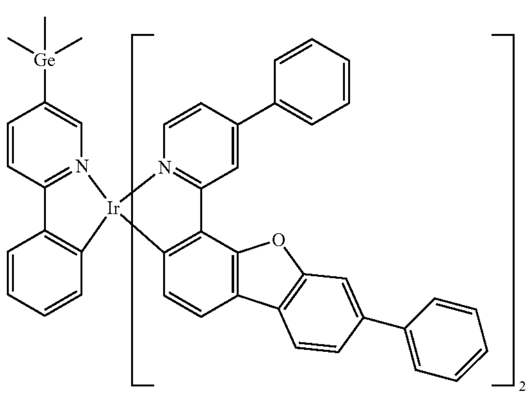
-continued
3492
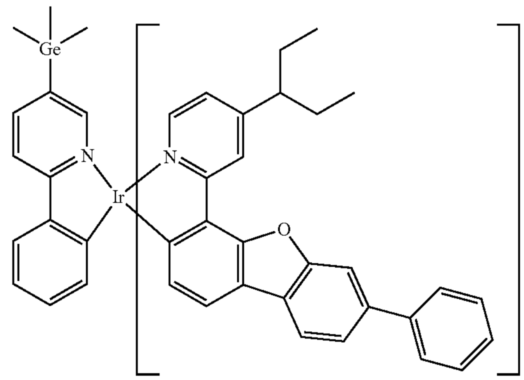
3493
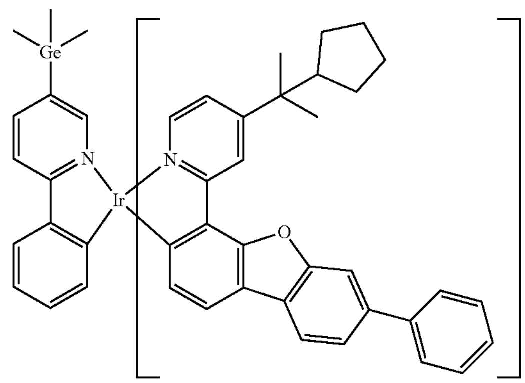
3494
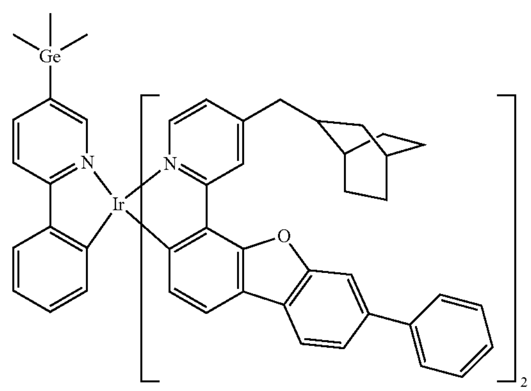
3495
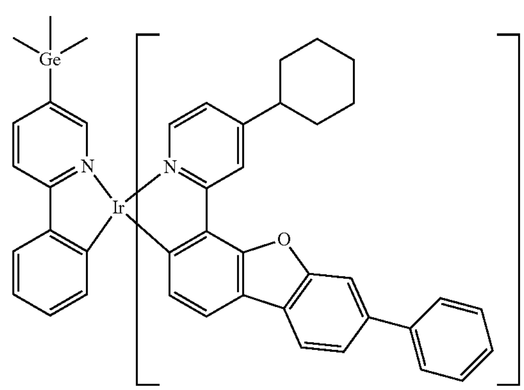

-continued
3496
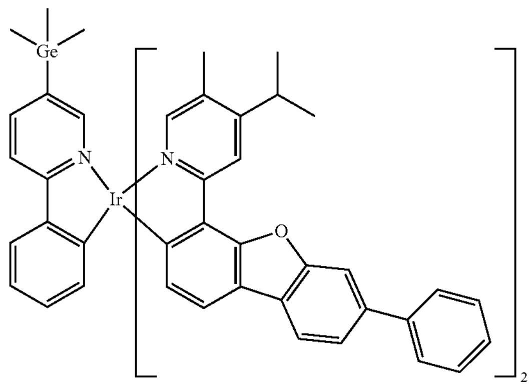
3497
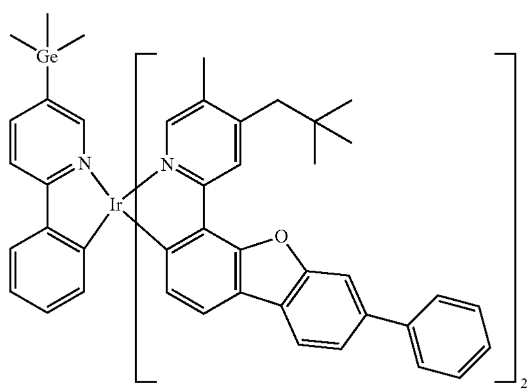
3498
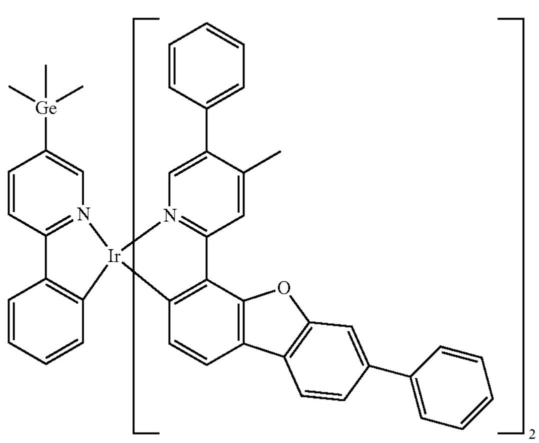
-continued
3499
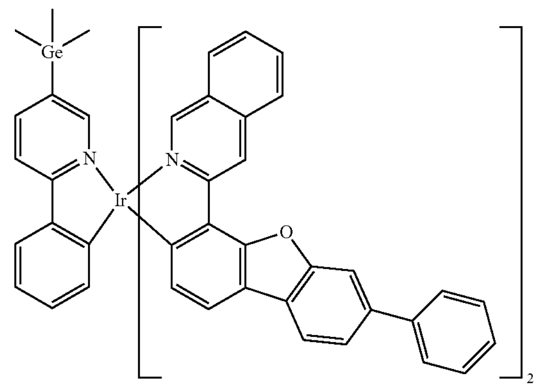
3500
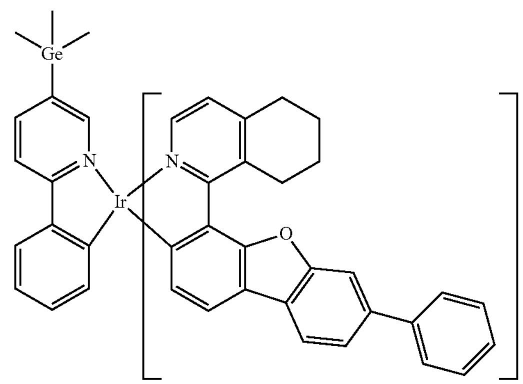
3501
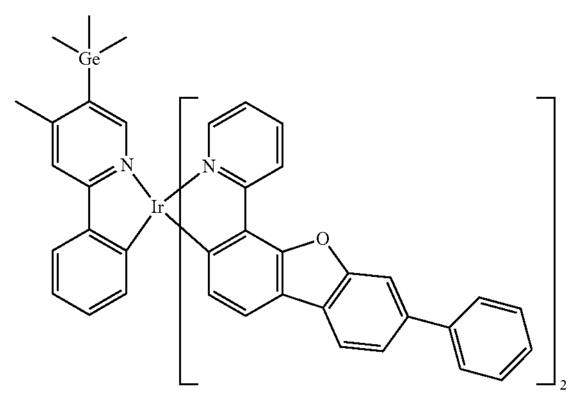
3502
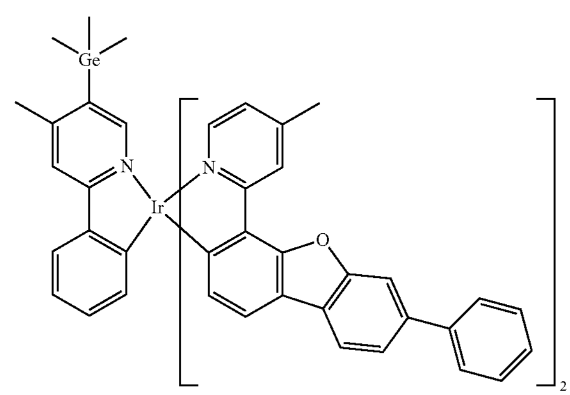

-continued
3503
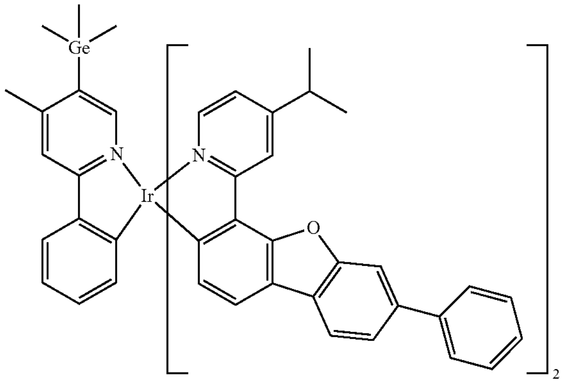
3504
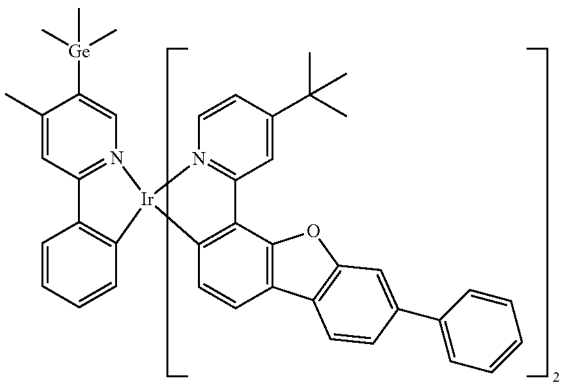
3505
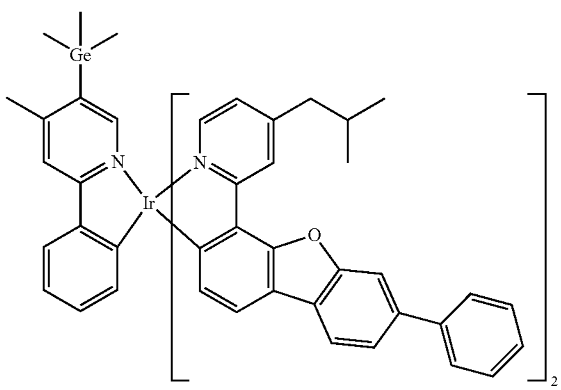
3506
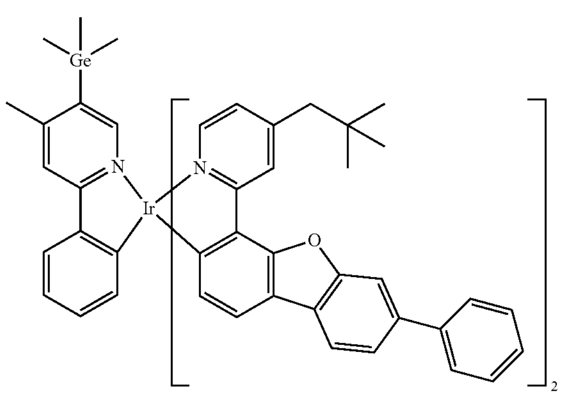
-continued
3507
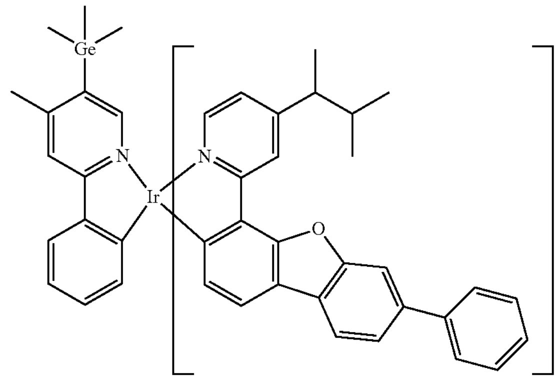
3508
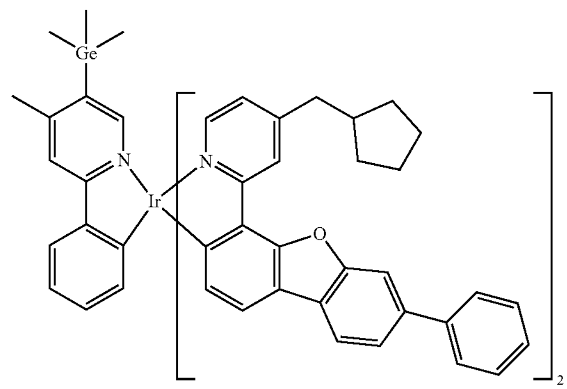
3509
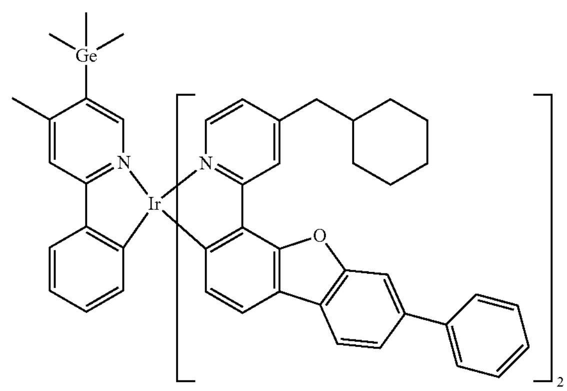
3510
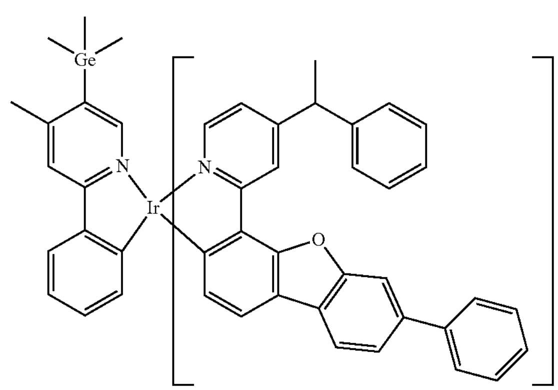

-continued
3511
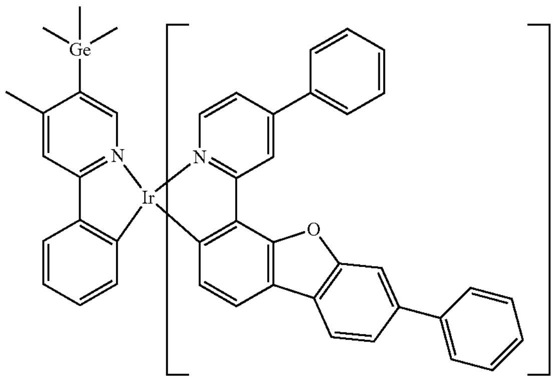
3512
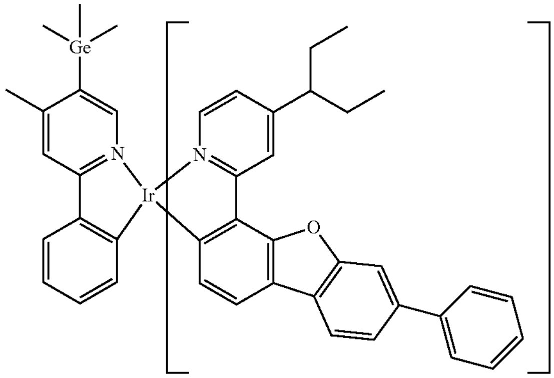
3513
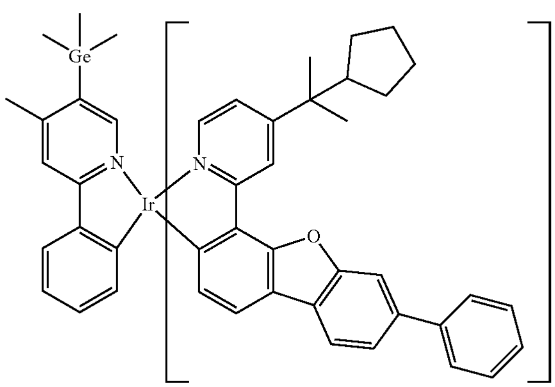
3514
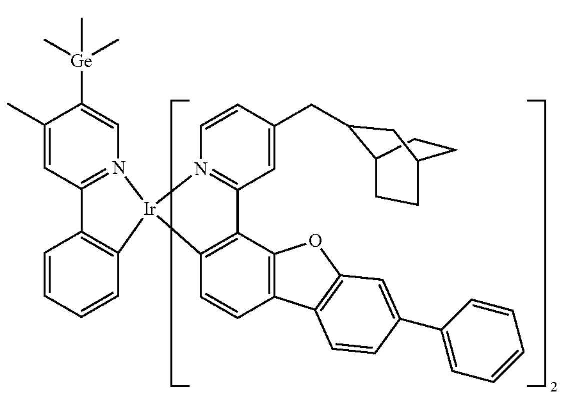
-continued
3515
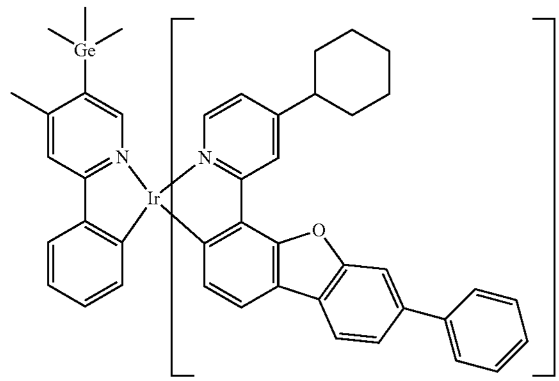
3516
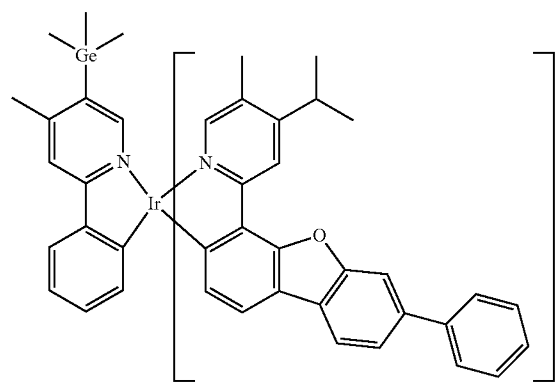
3517
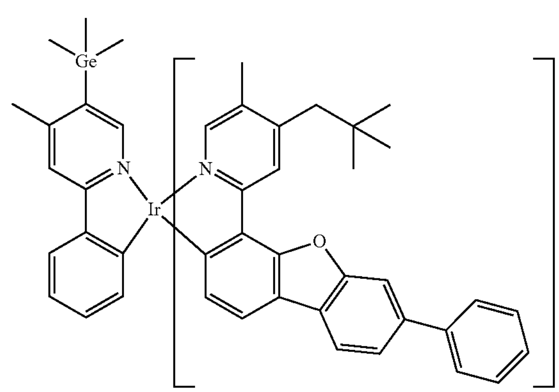

-continued
3518
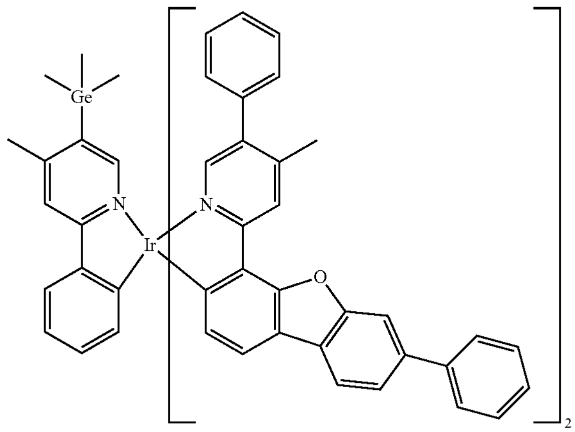
3519
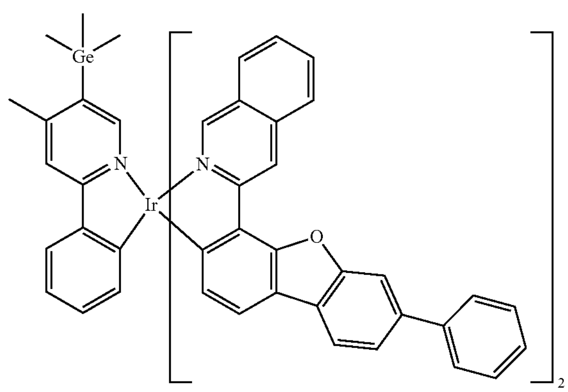
3520
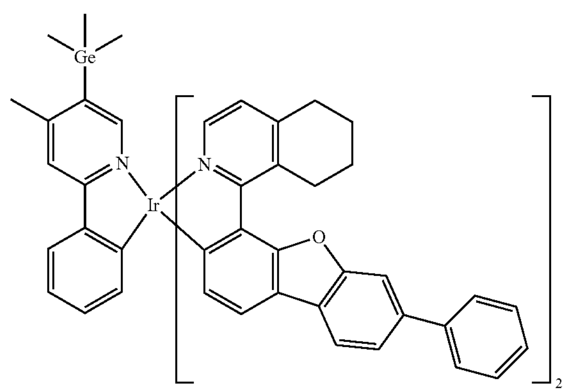
3521
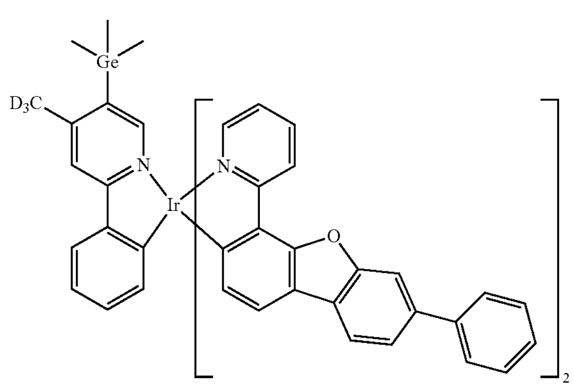
-continued
3522
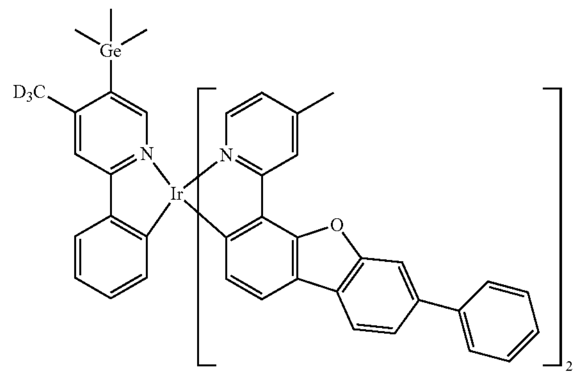
3523
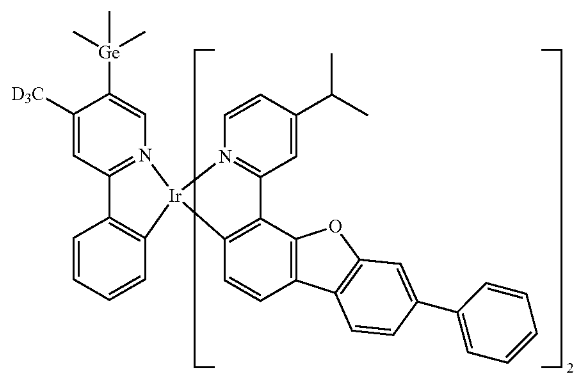
3524
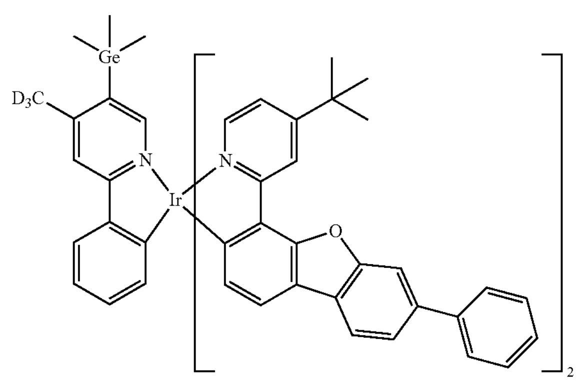
3525
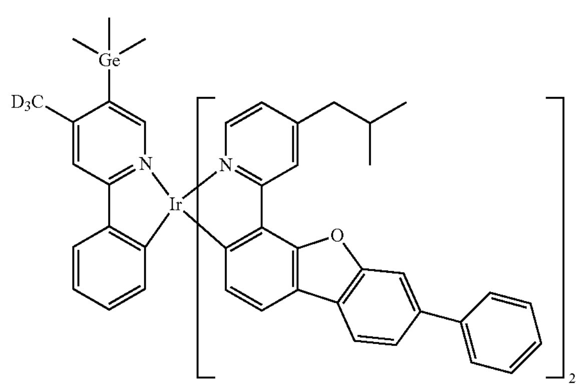

-continued
3526
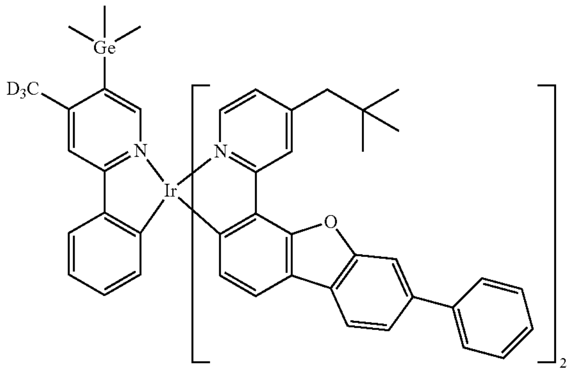
3527
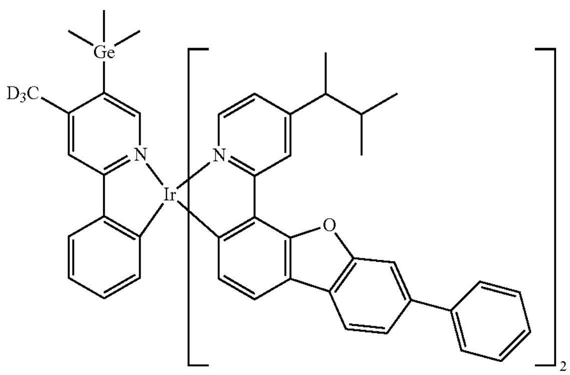
3528
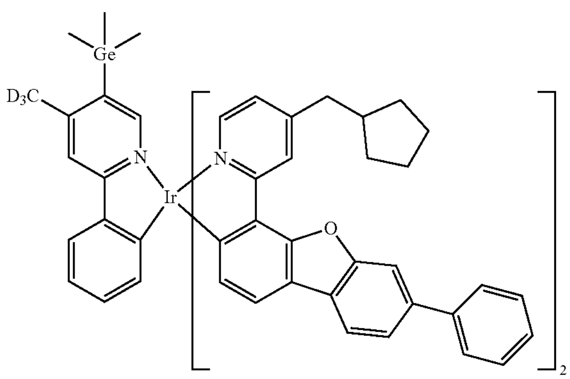
3529
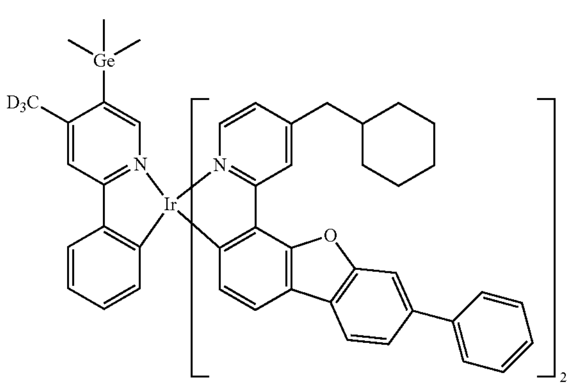
-continued
3530
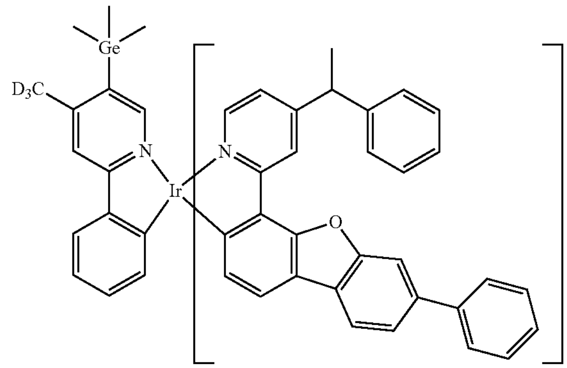
3531
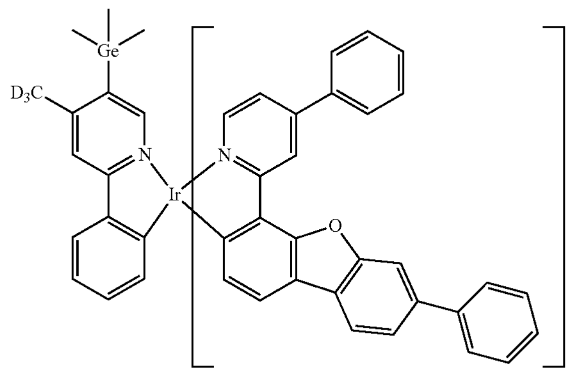
3532
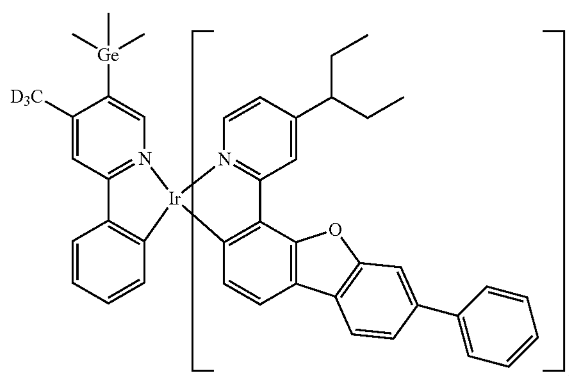
3533
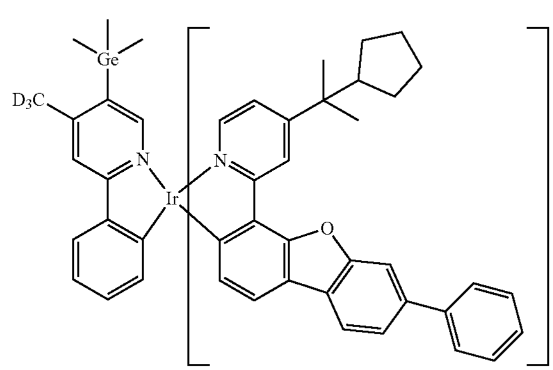

-continued
3534
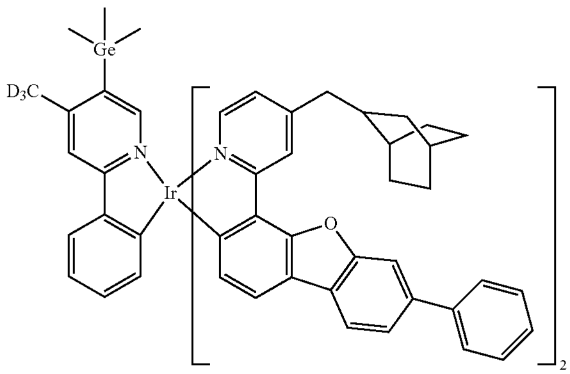
3535
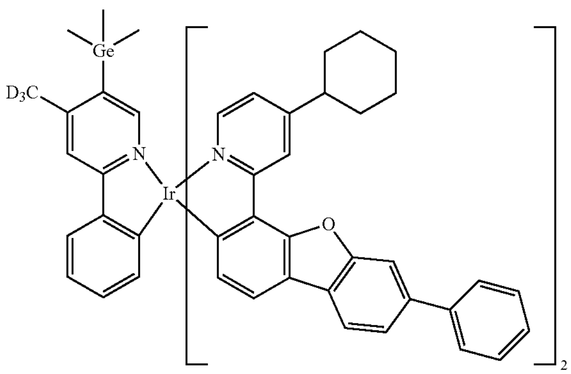
3536
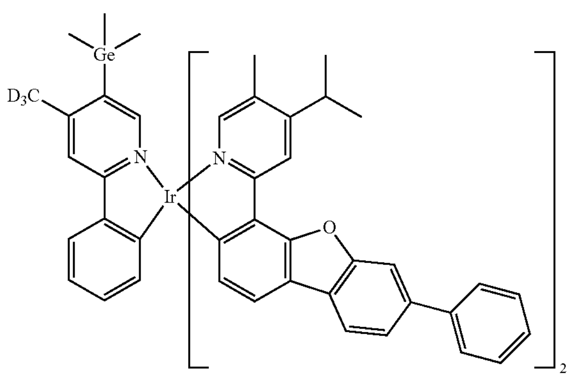
3537
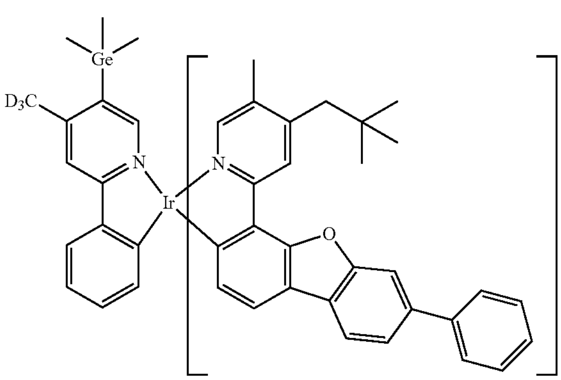
-continued
3538
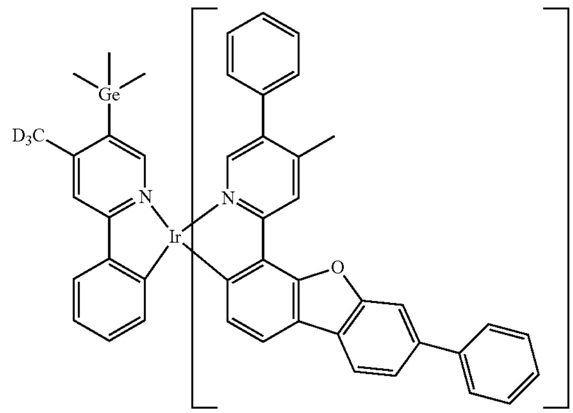
3539
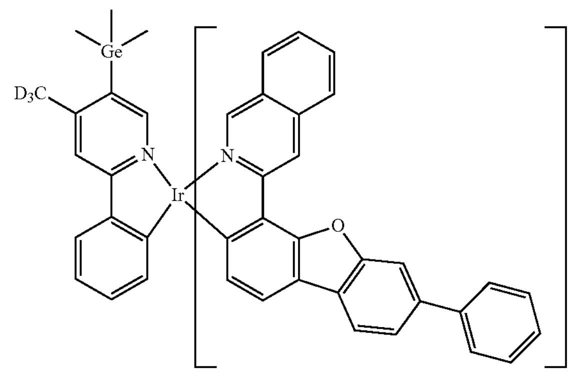
3540
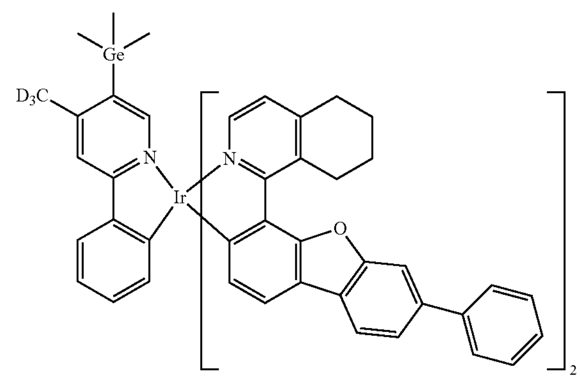
3541
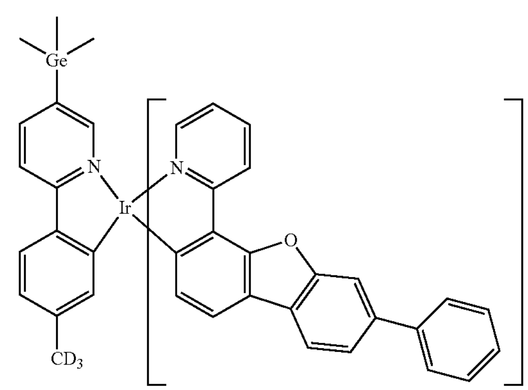

3542
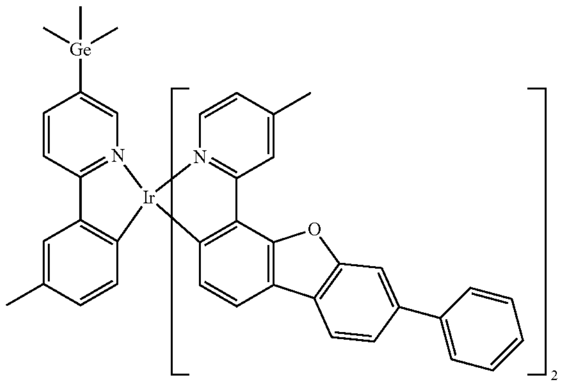
3543
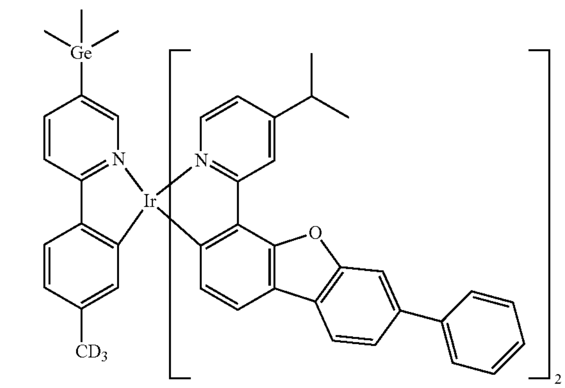
3544
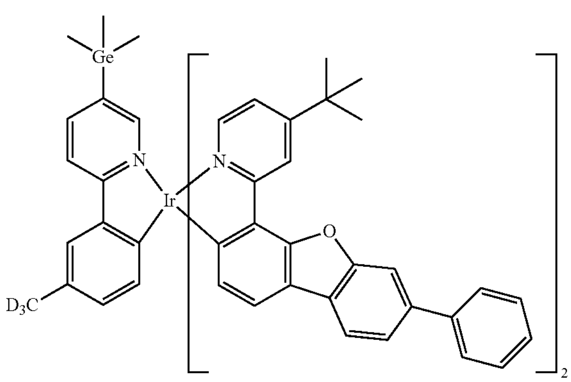
3545
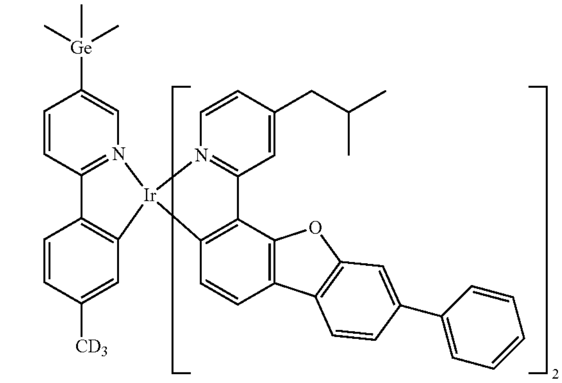
3546
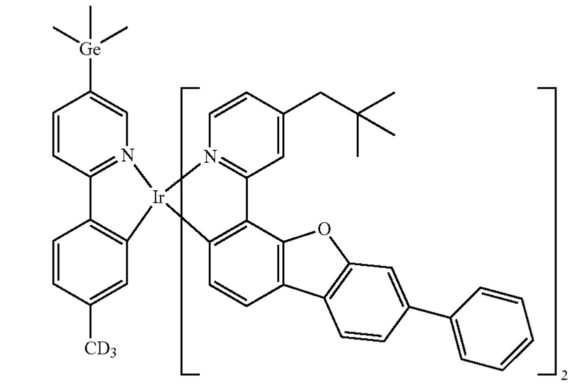
3547
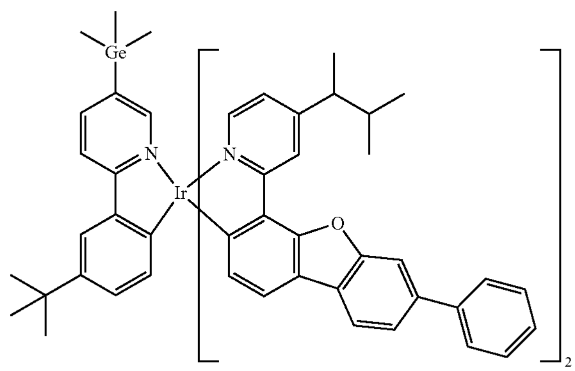
3548
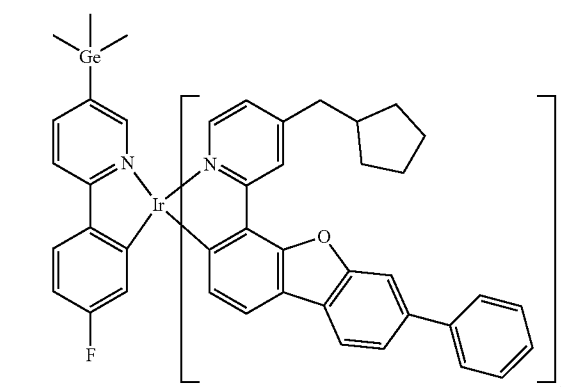
3549
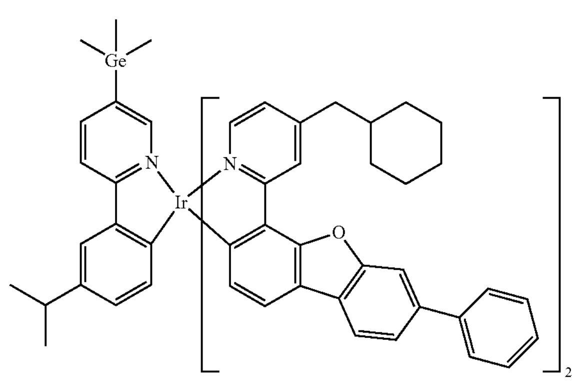

-continued
3550
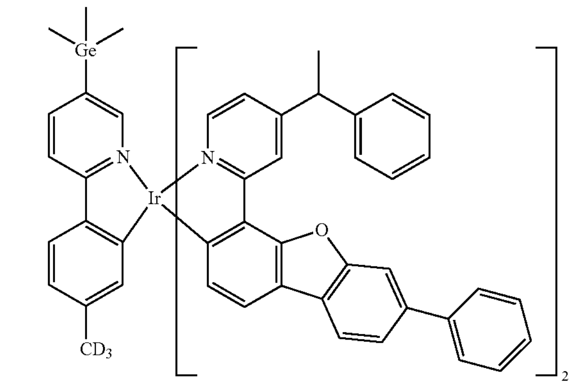
3551
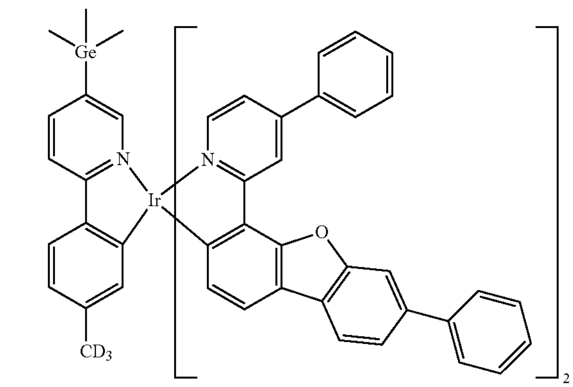
3552
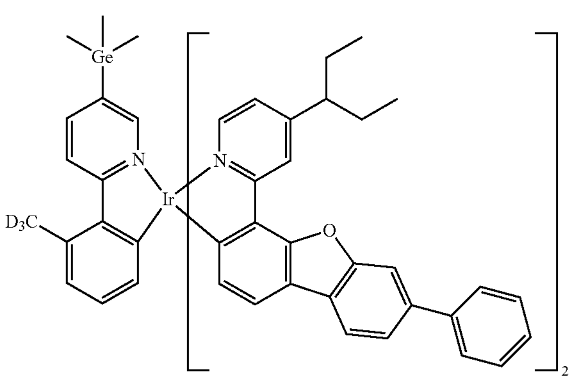
3553
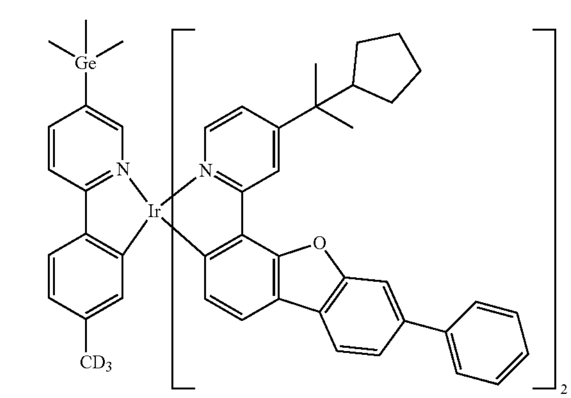
-continued
3554
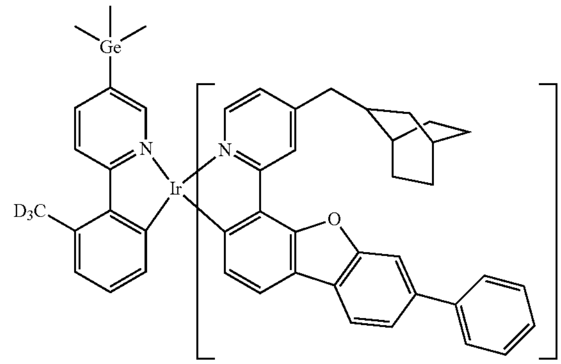
3555
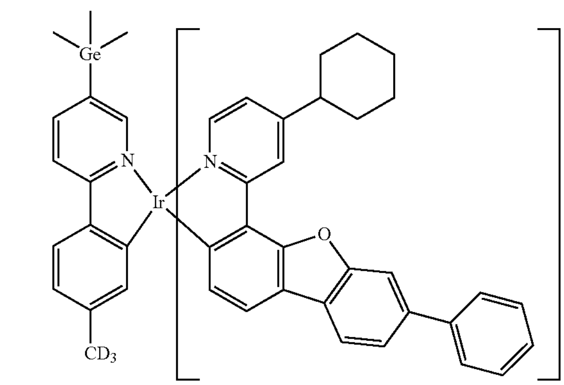
3556
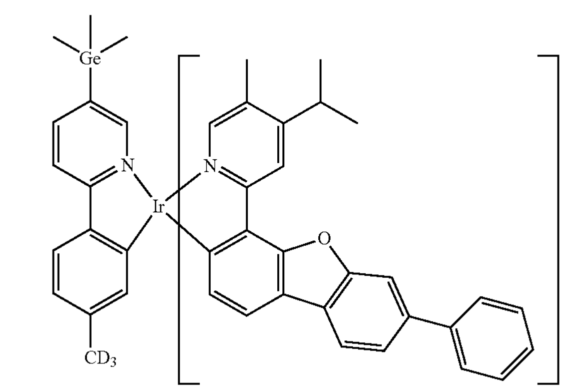
3557
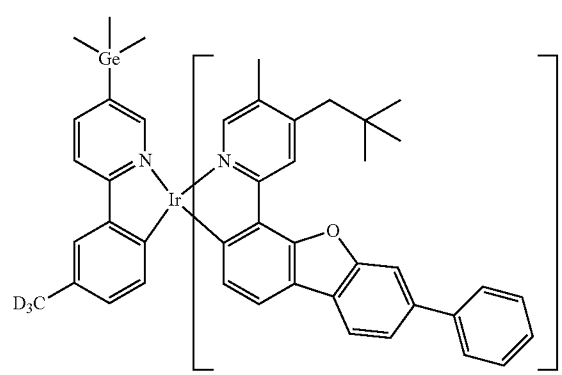

-continued
3558
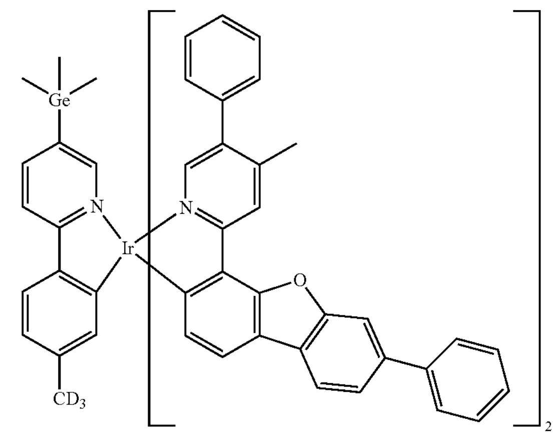
3559
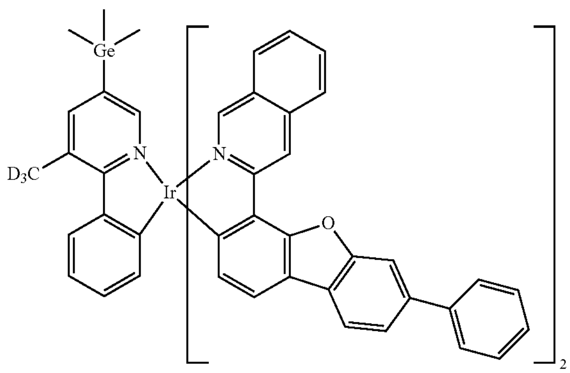
3560
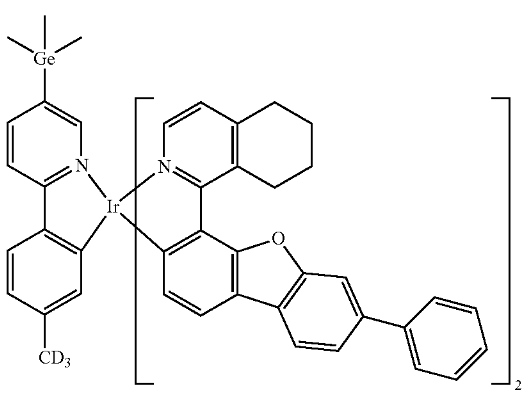
3561
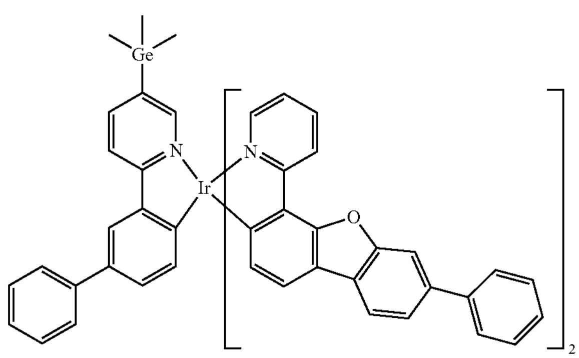
-continued
3562
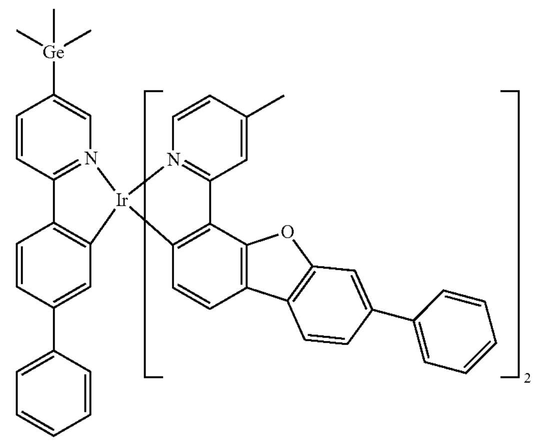
3563
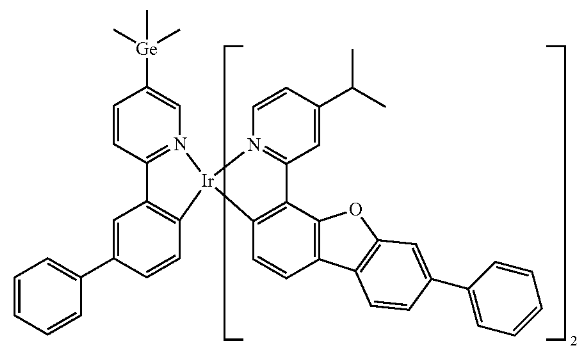
3564
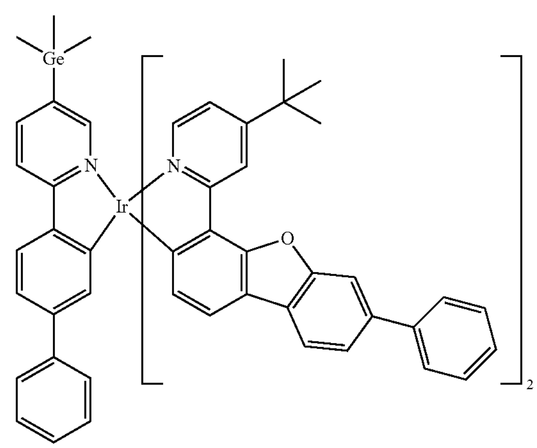
3565
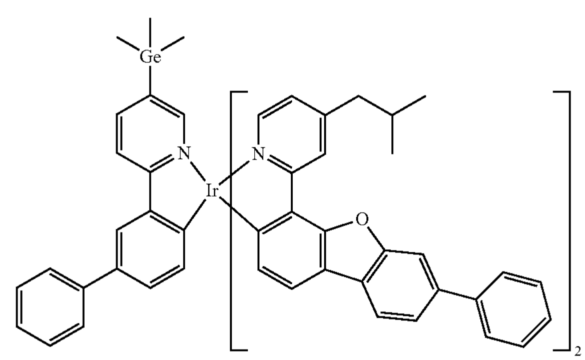

3566
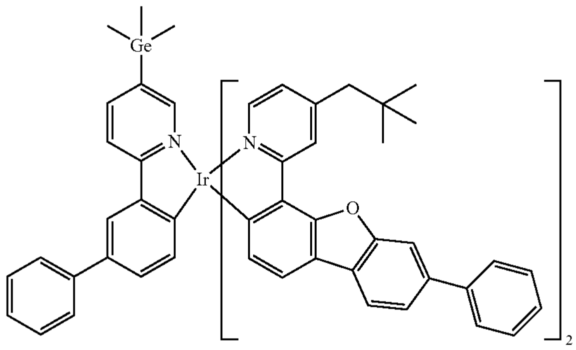
3567
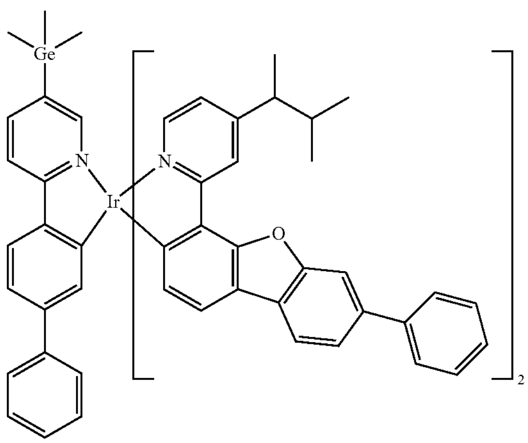
3568
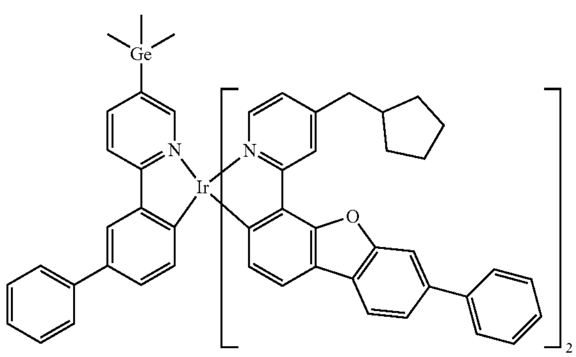
3569
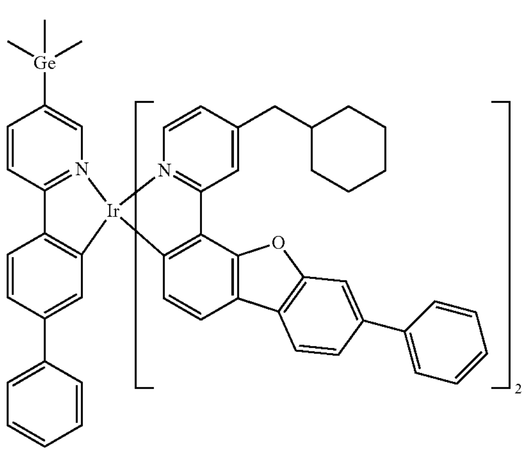
3570
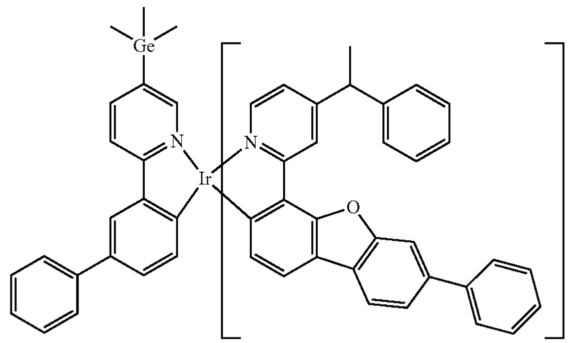
3571
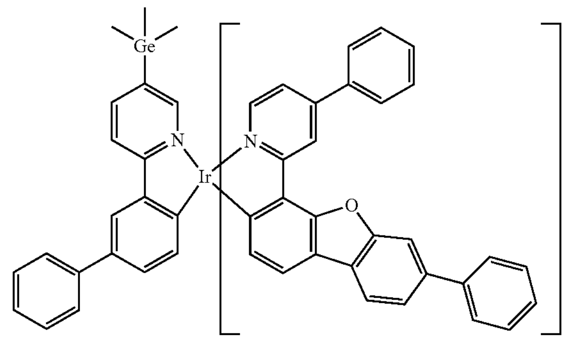
3572
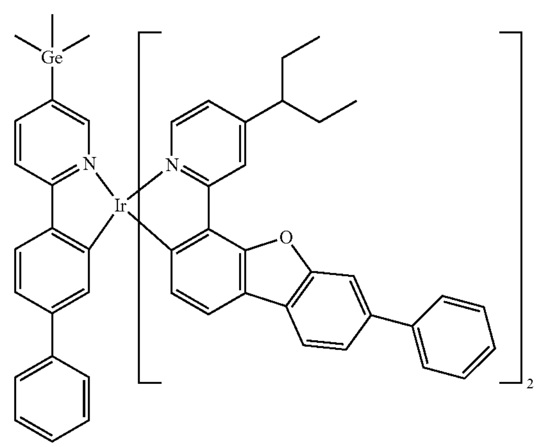
3573
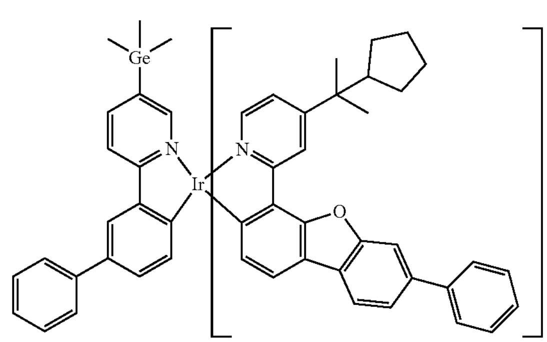

3574
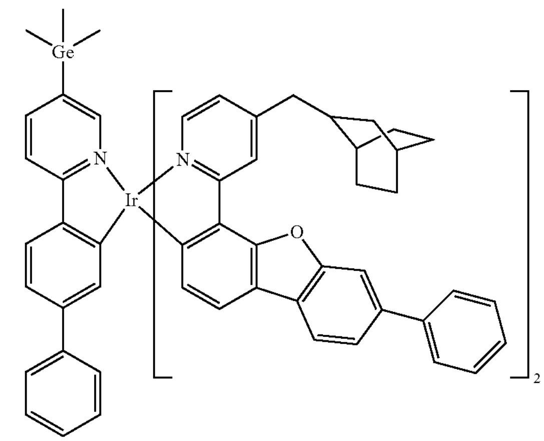
3575
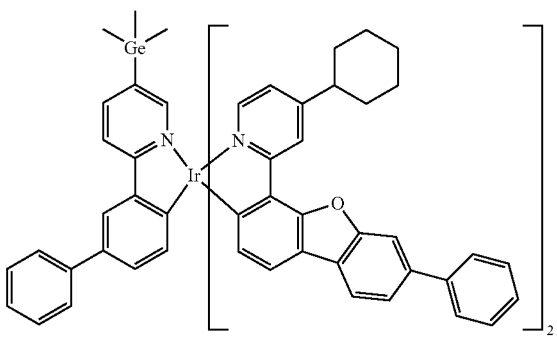
3576
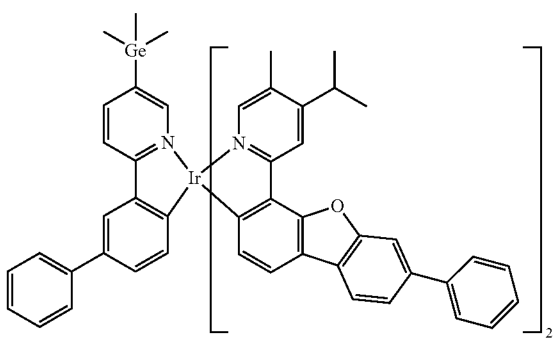
3577
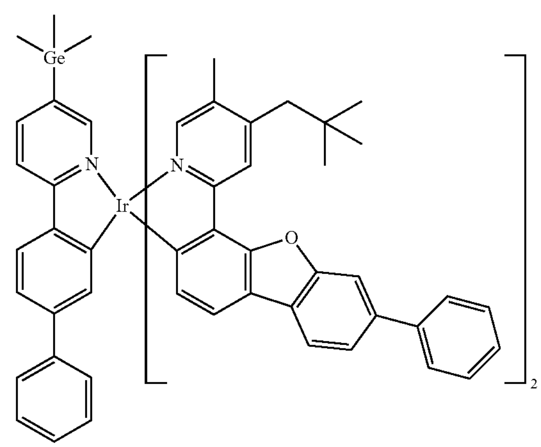
3578
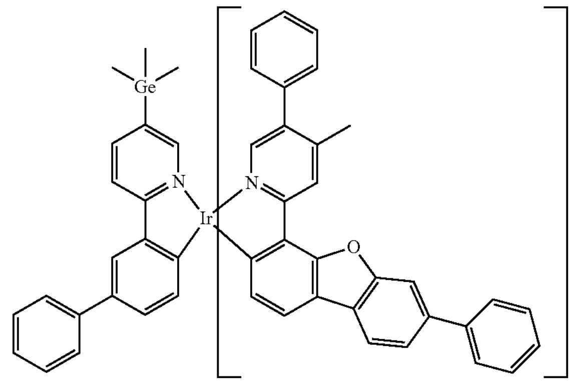
3579
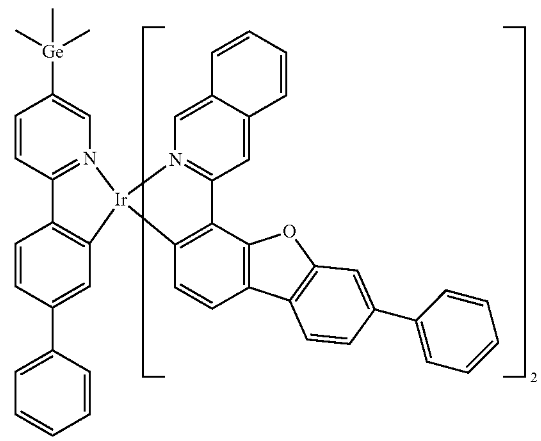
3580
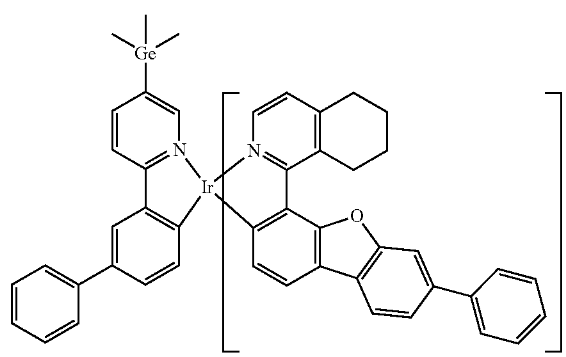
3581
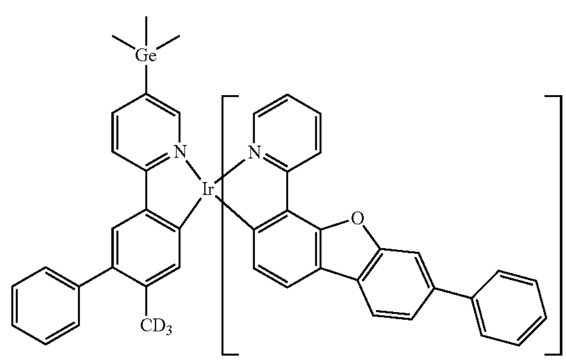

-continued
3582
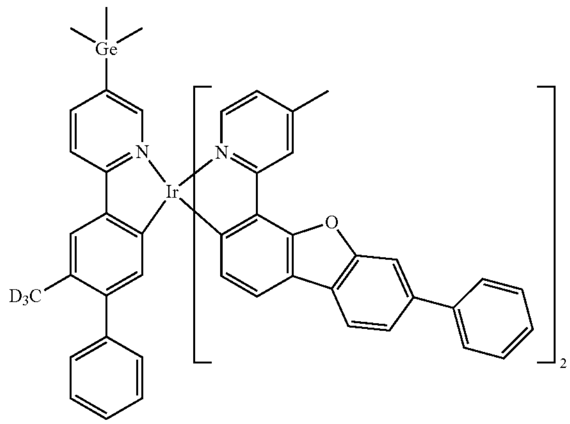
3583
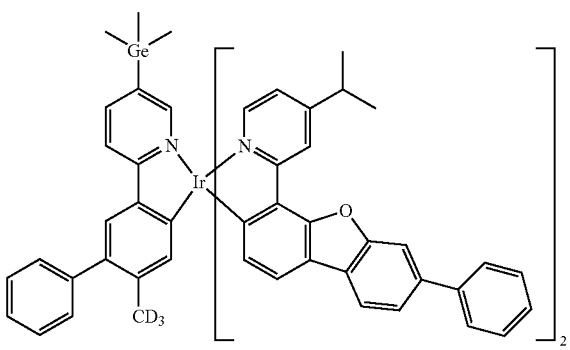
3584
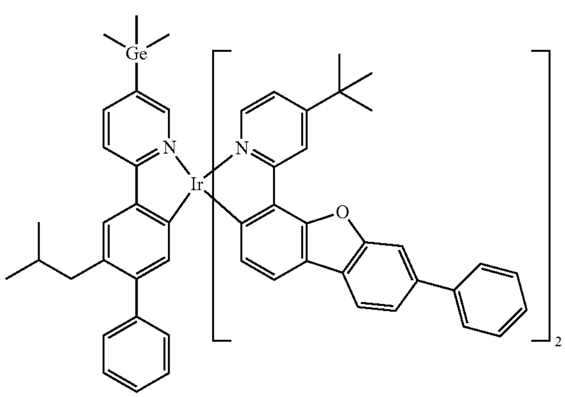
3585
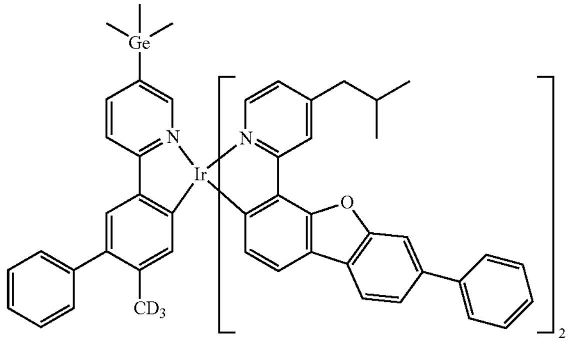
-continued
3586
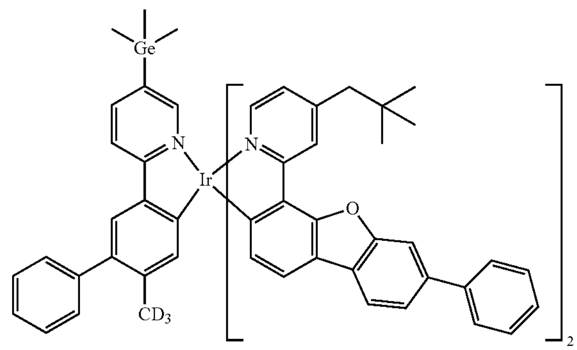
3587
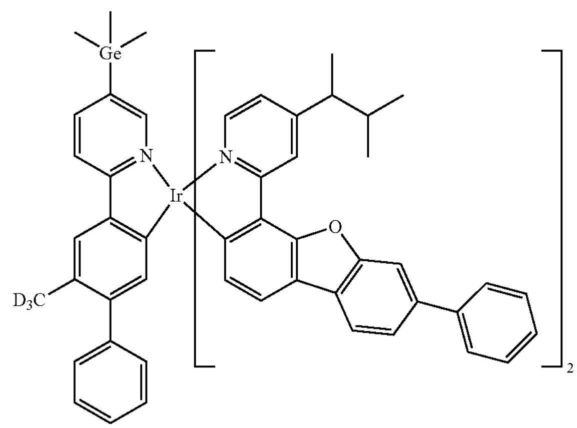
3588
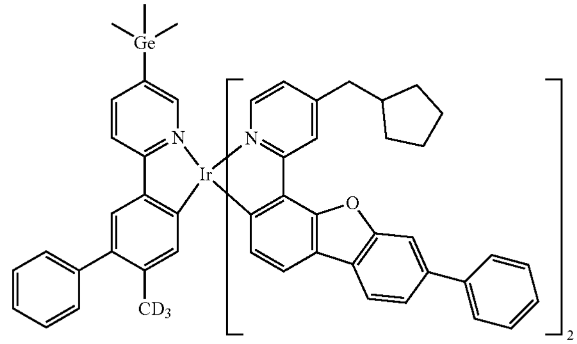
3589
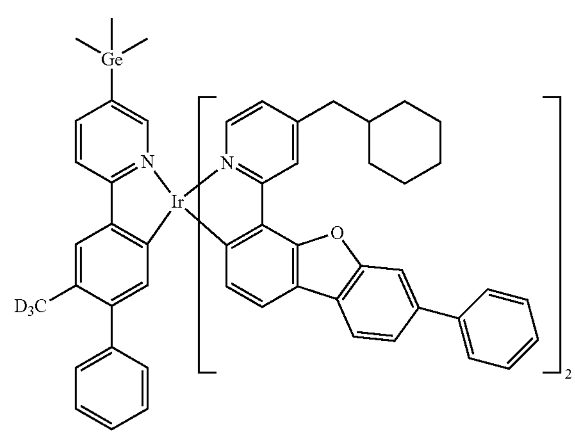

-continued
3590
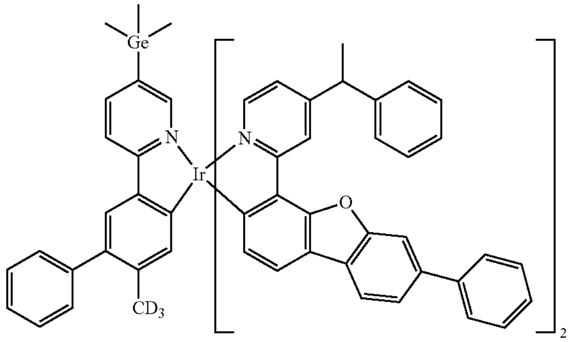
3591
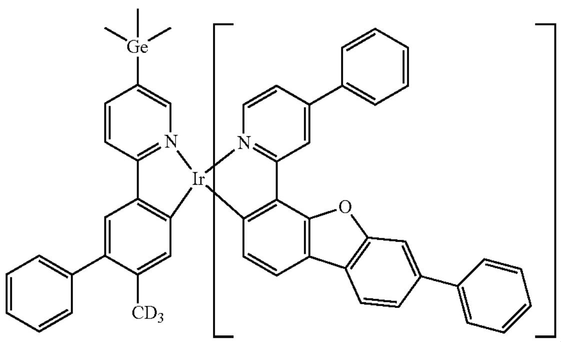
3592
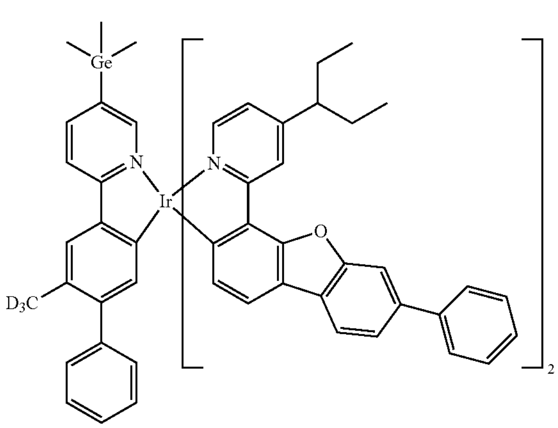
3593
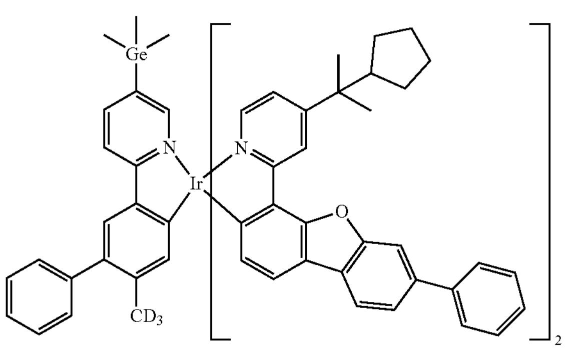
-continued
3594
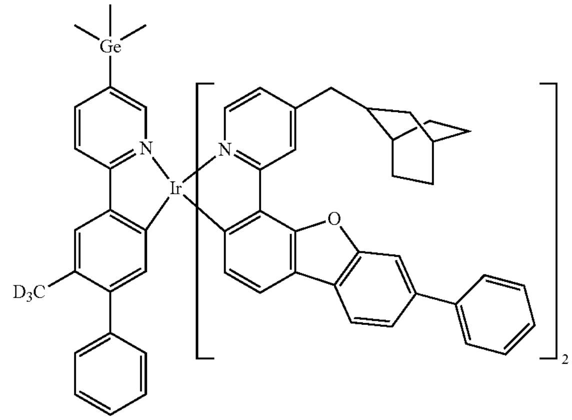
3595
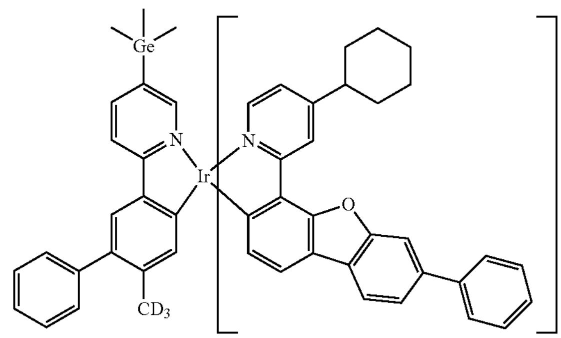
3596
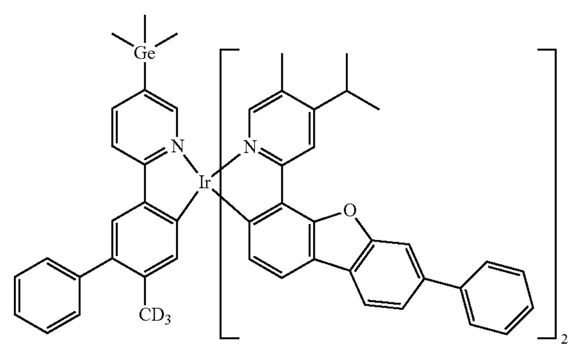

-continued
3597
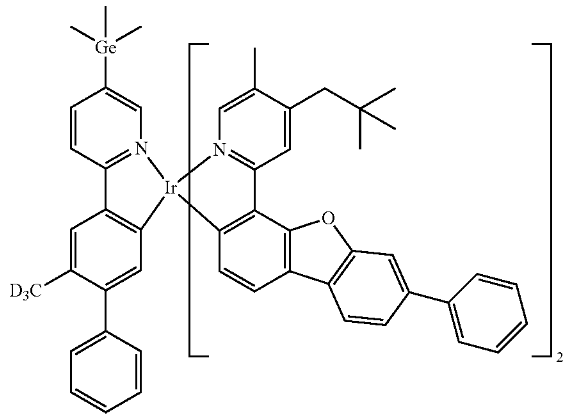
3598
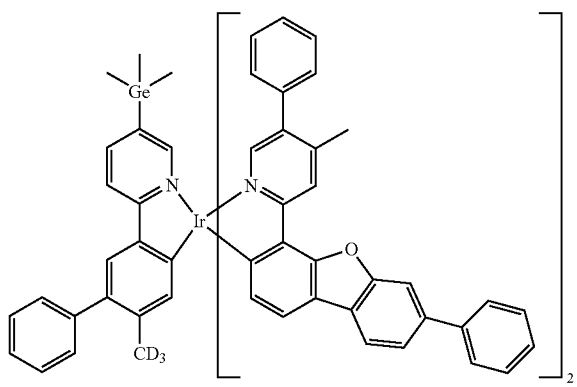
-continued
3599
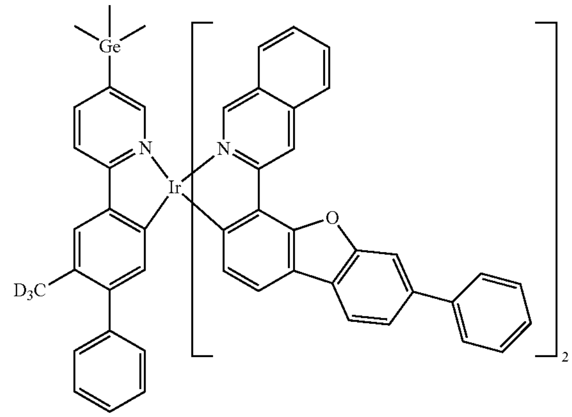
3600
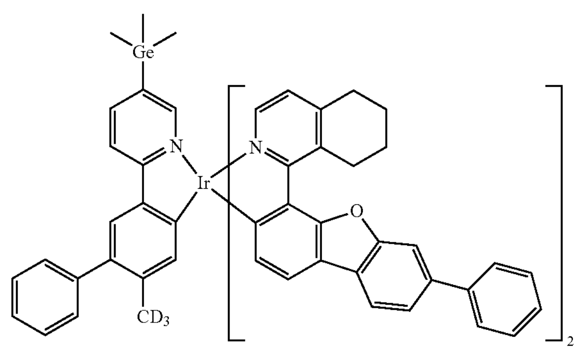
3601
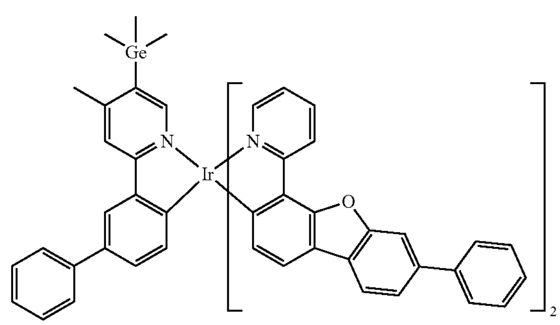

-continued
3602
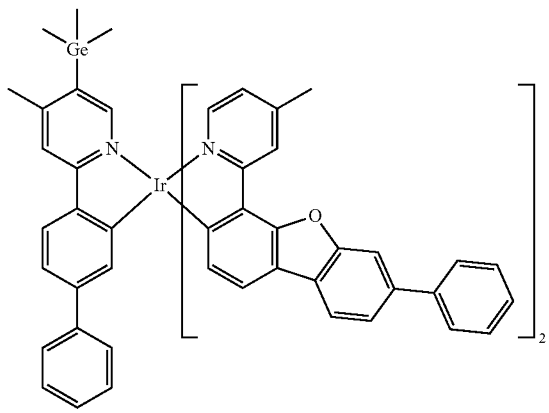
3603
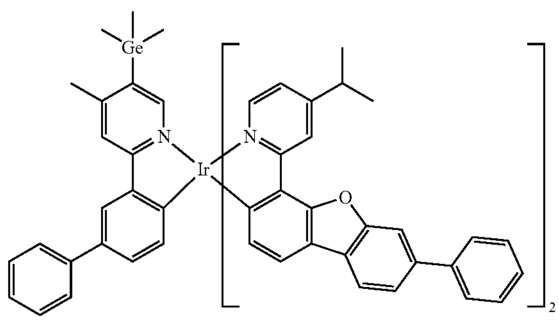
3604
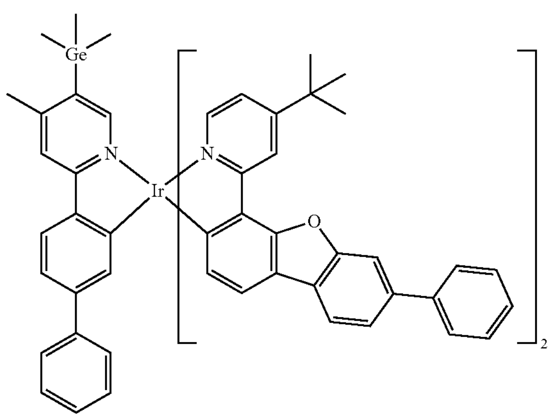
3605
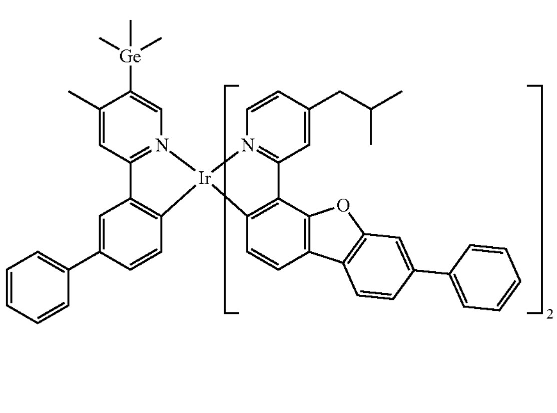

-continued
3606
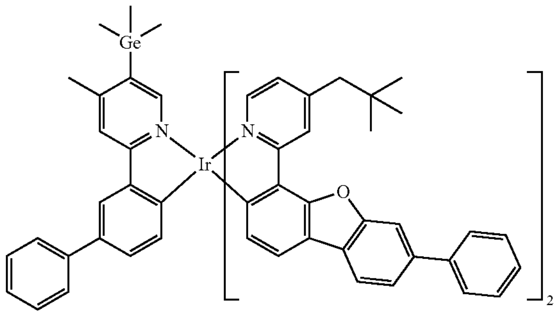
3607
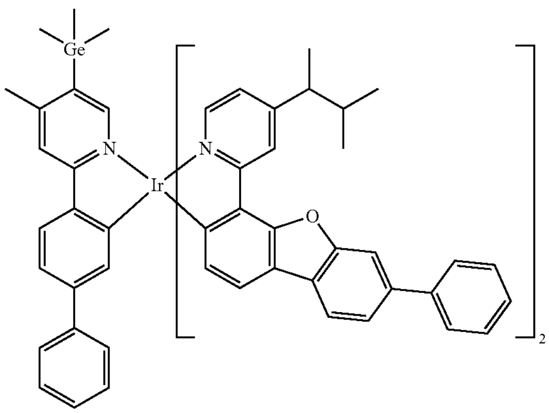
3608
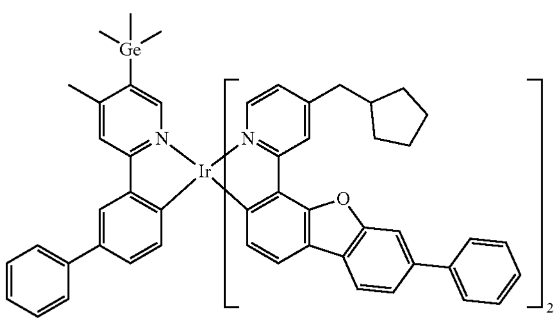
3609
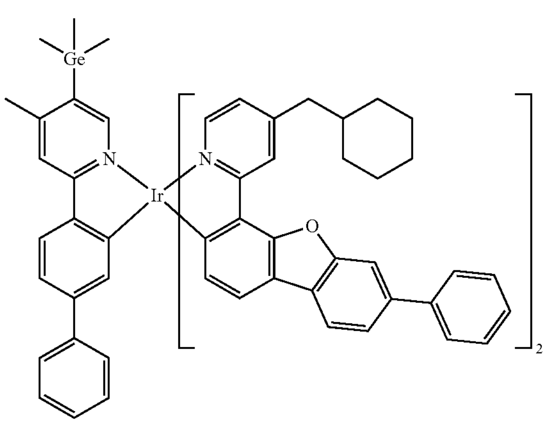

-continued
3610
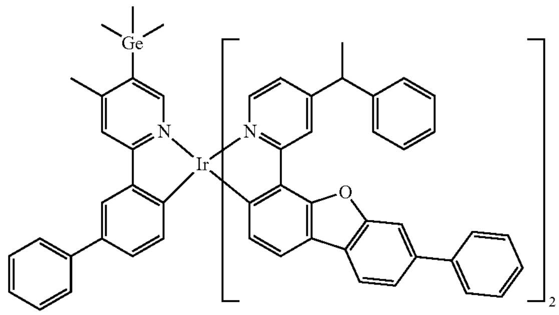
3611
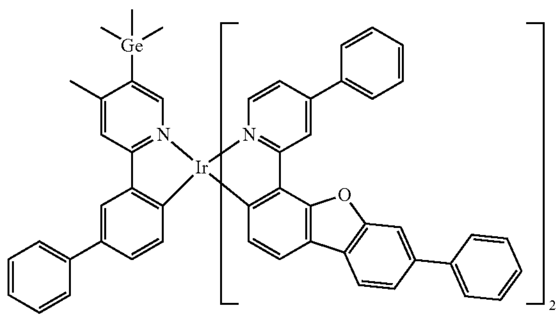
3612
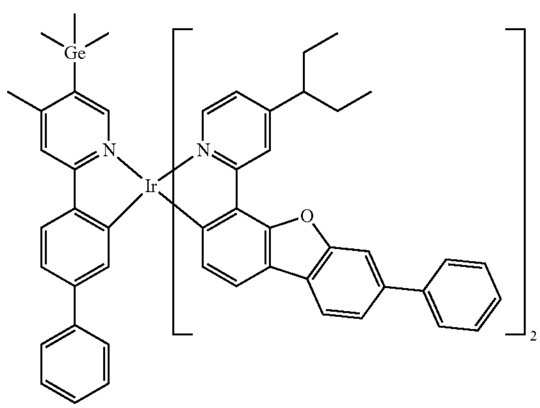
3613
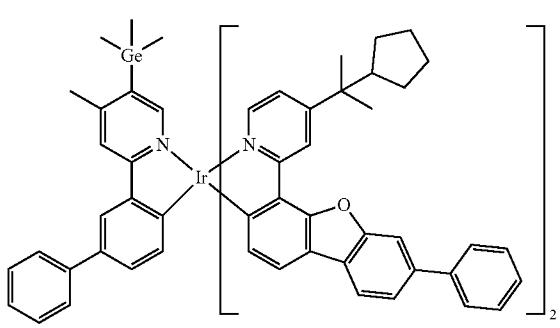

-continued
3614
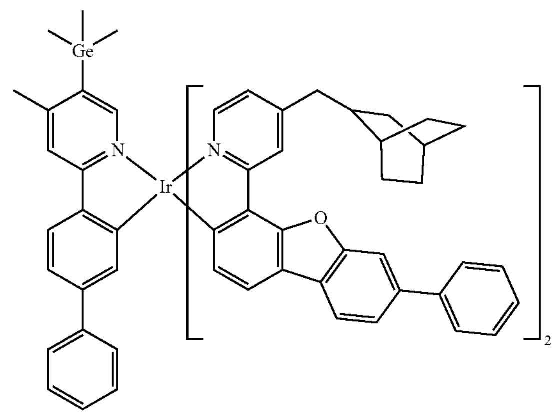
3615
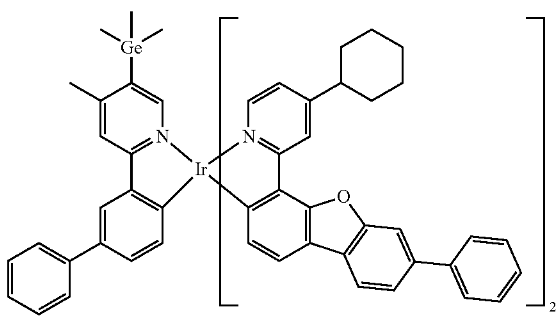
3616
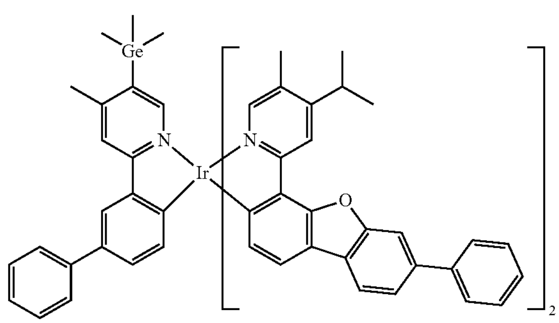
3617
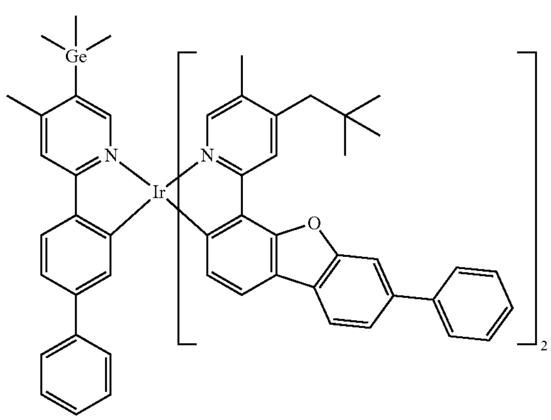

-continued
3618
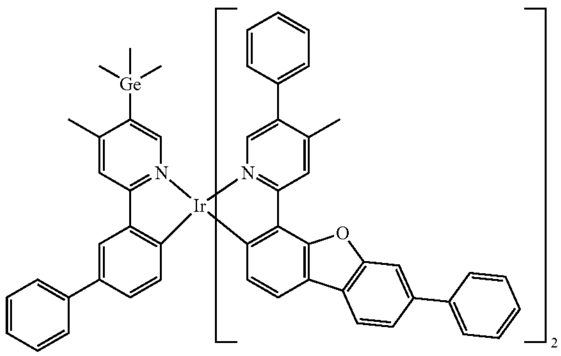
3619
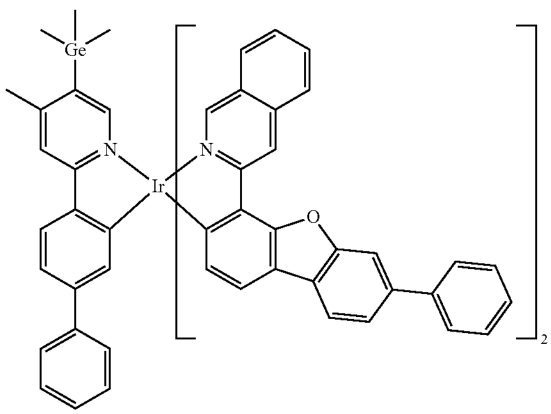
3620
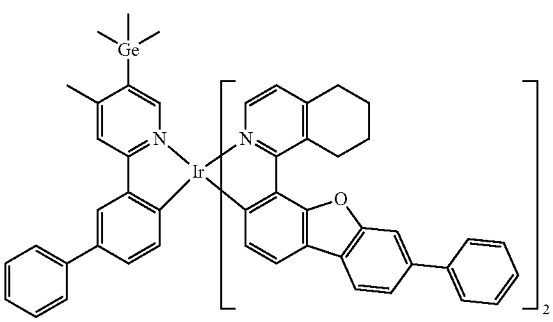
3621
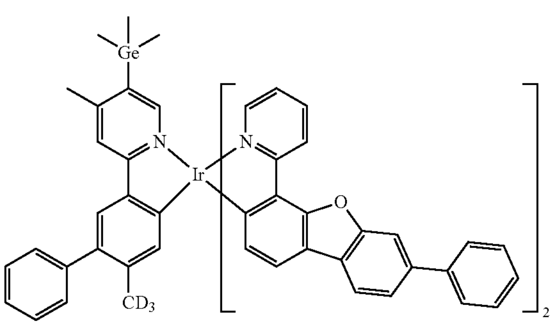

-continued
3622
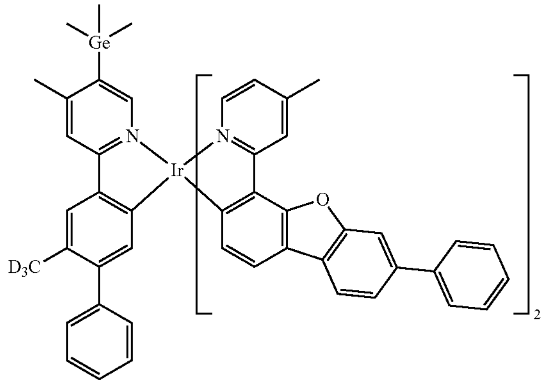
3623
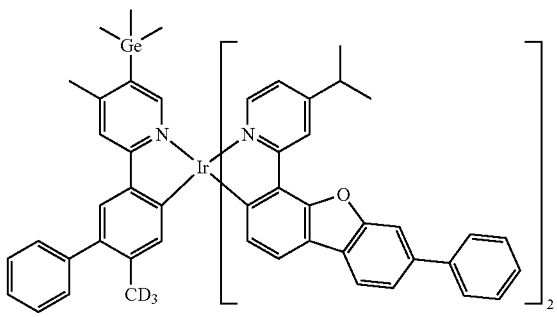
3624
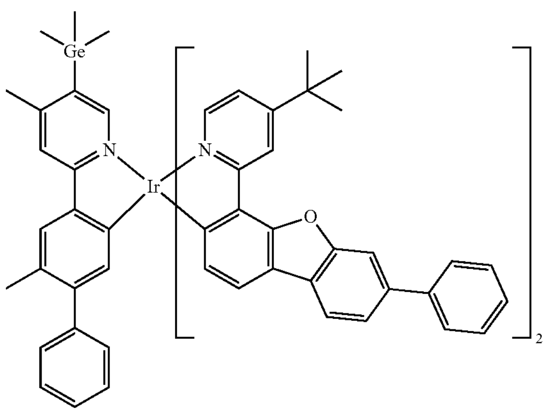
3625
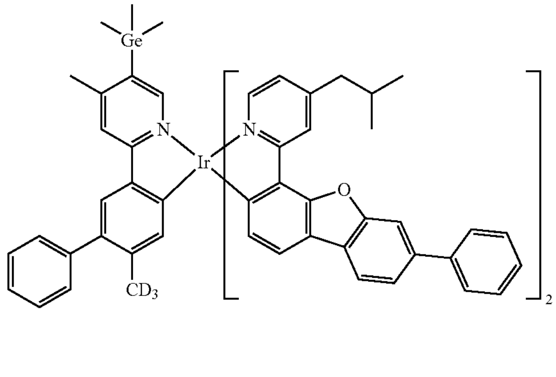

-continued
3626
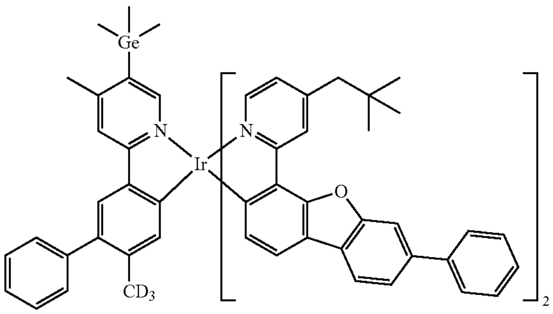
3627
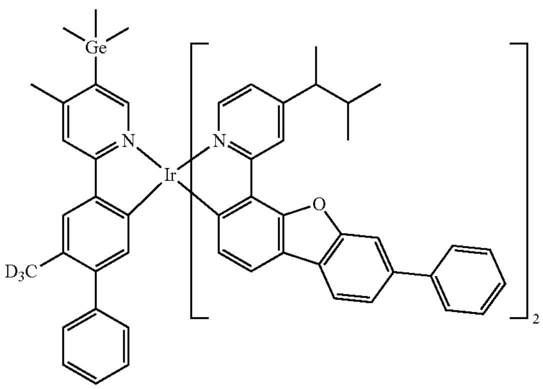
3628
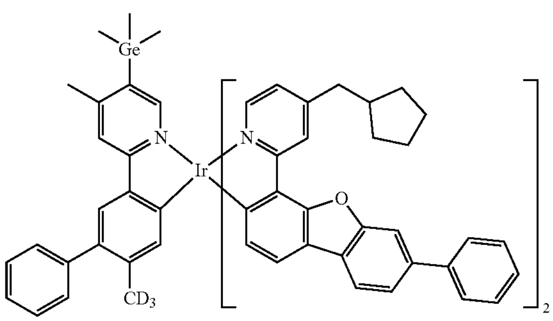
3629
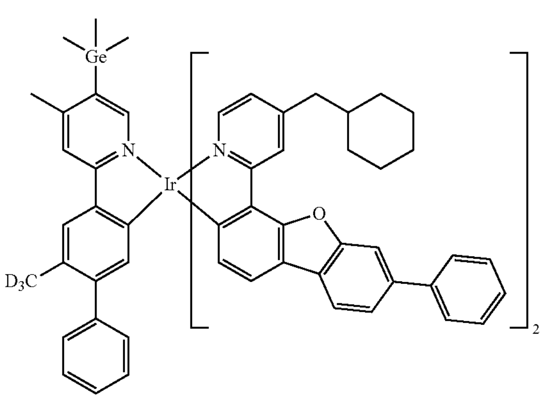

-continued
3630
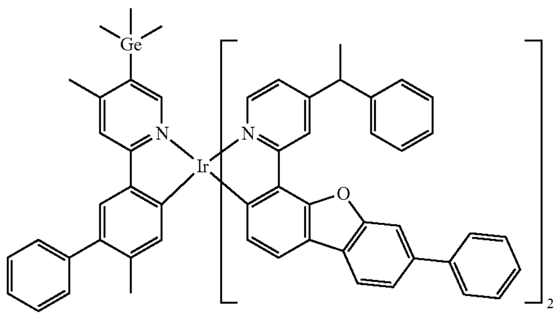
3631
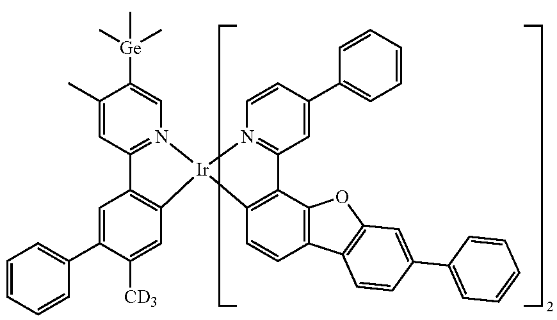
3632
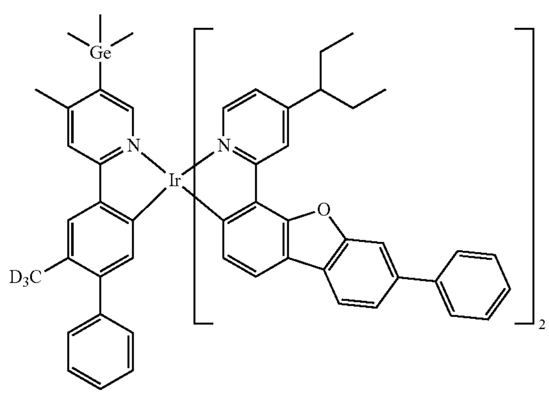
3633
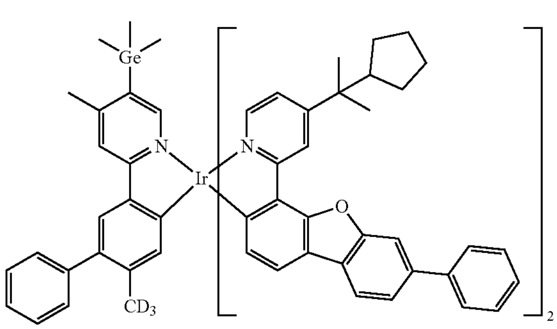

-continued
3634
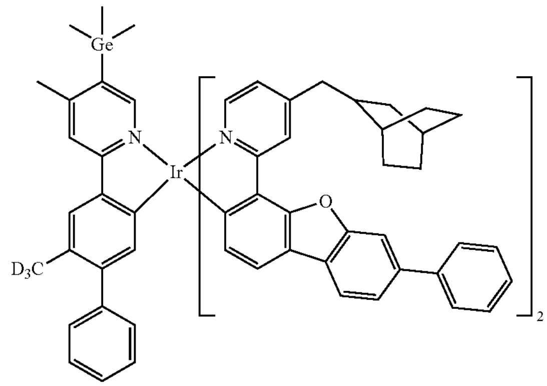
3635
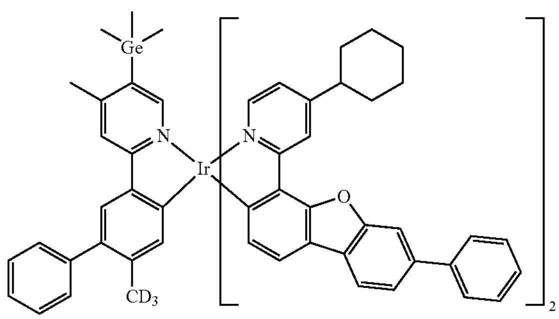
3636
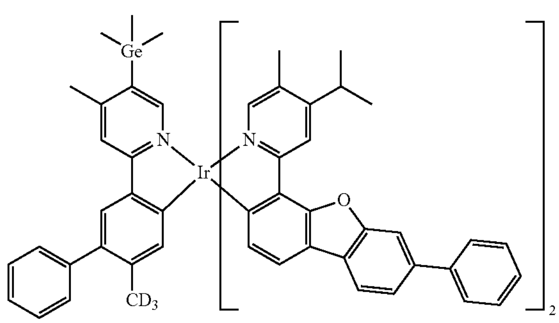
3637
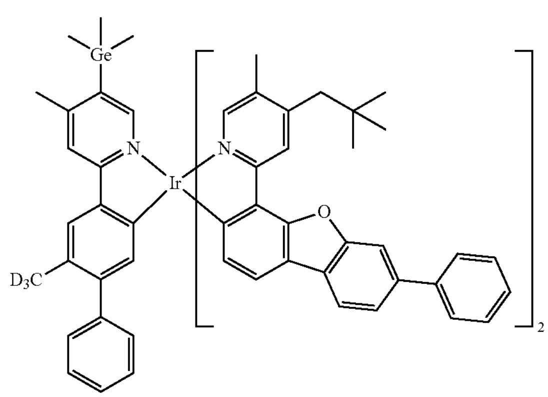

-continued
3638
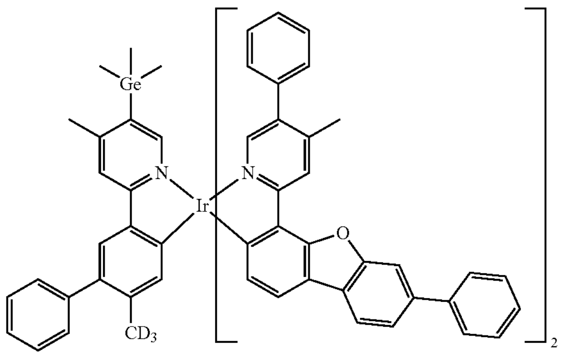
3639
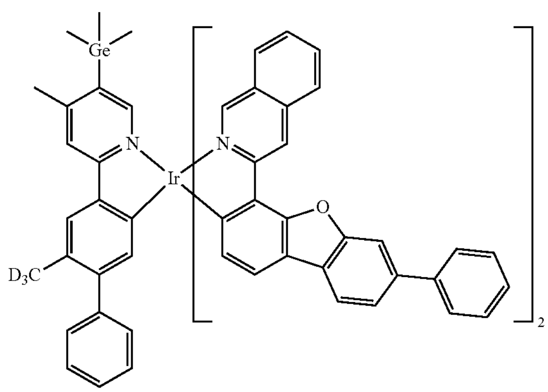
3640
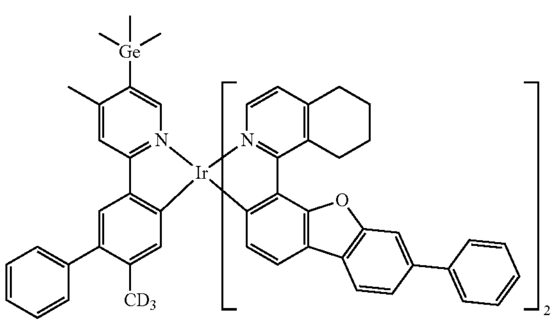
3641
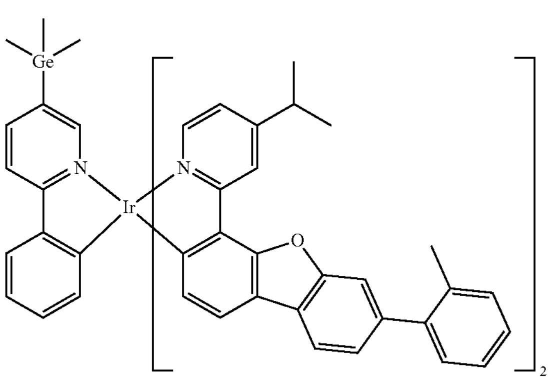

-continued
3642
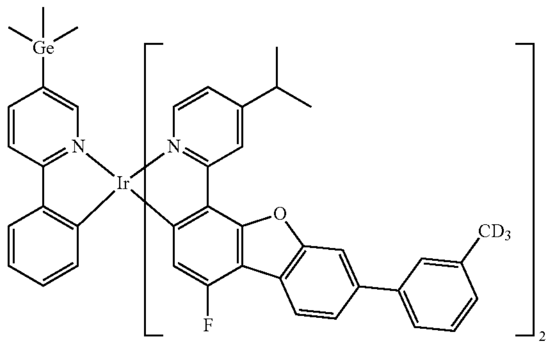
3643
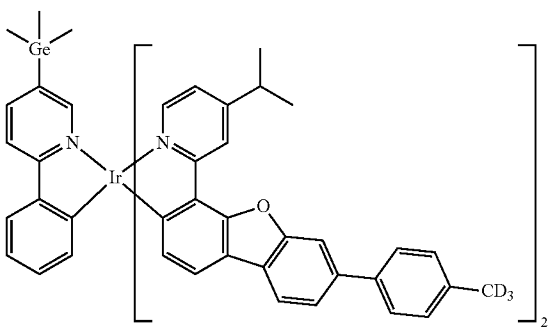
3644
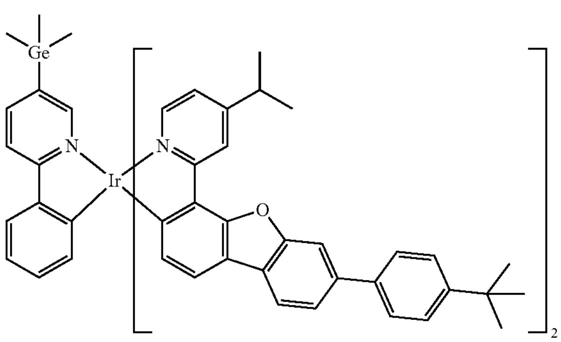
3645
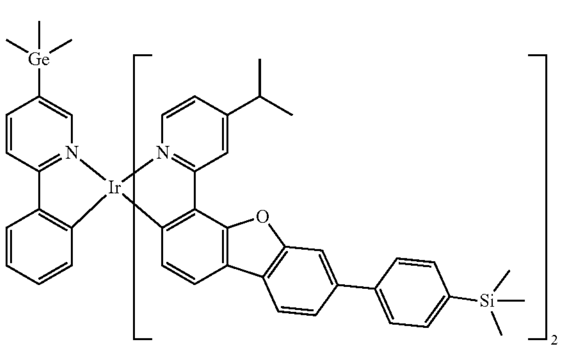

-continued
3646
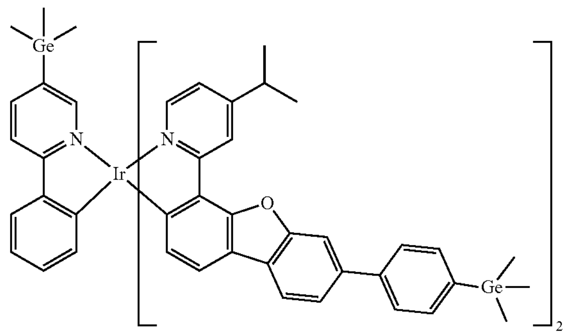
3647
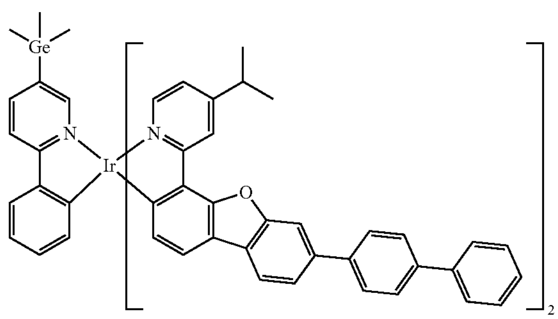
3648
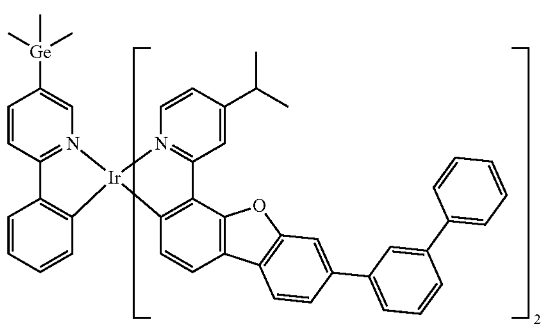
3649
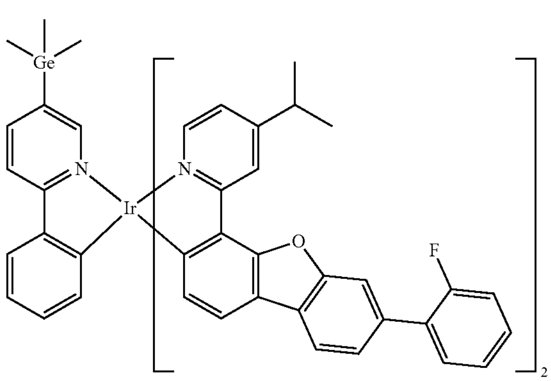

-continued
3650
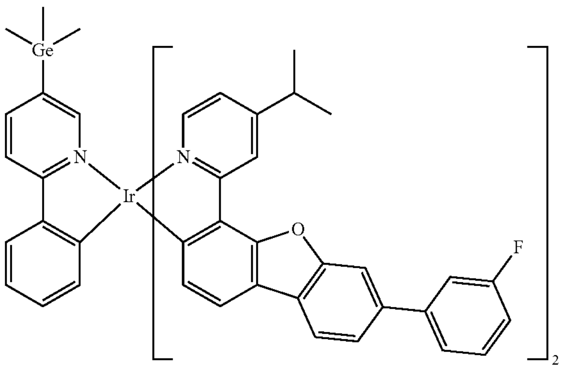
3651
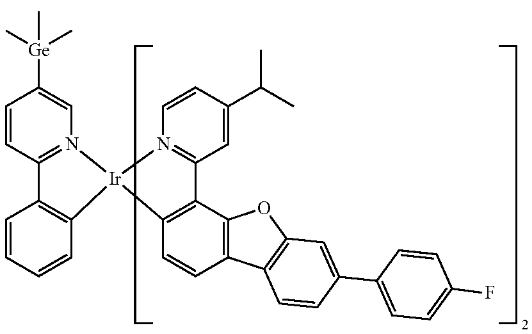
3652
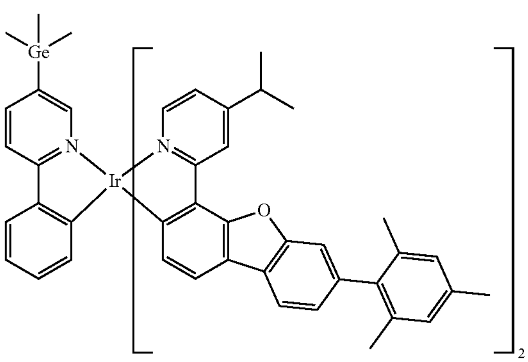
3653
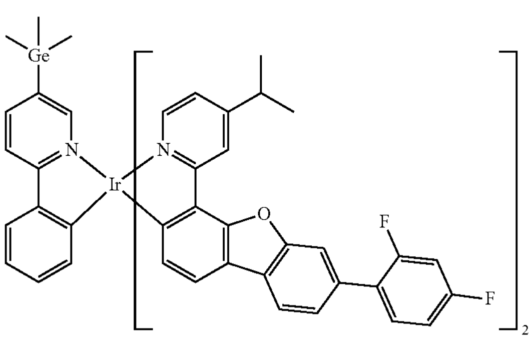

-continued
3654
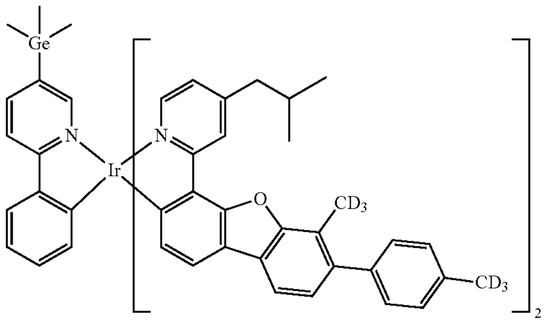
3655
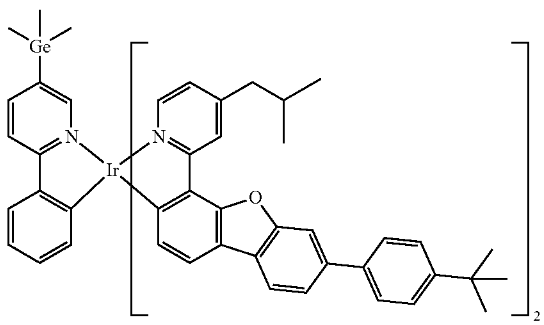
3656
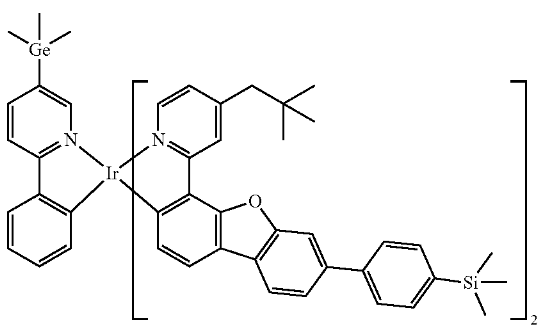
3657
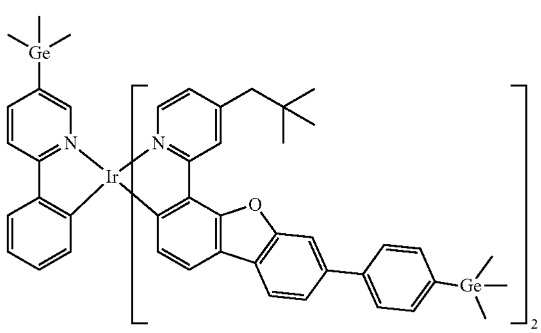

-continued
3658
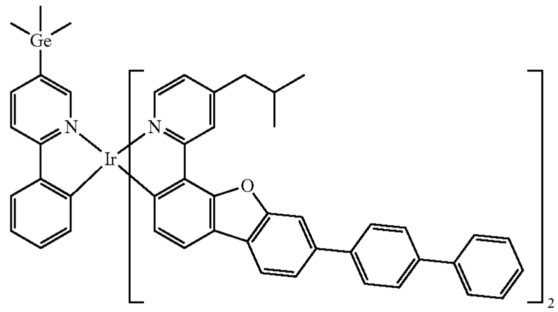
3659
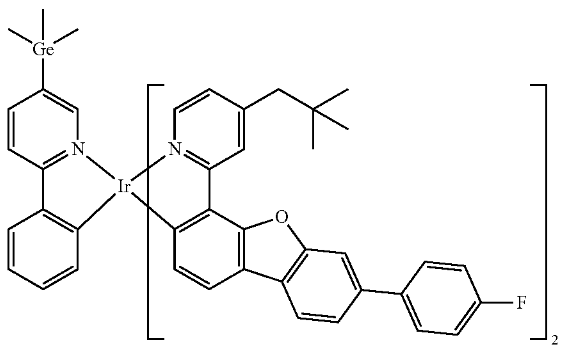
3660
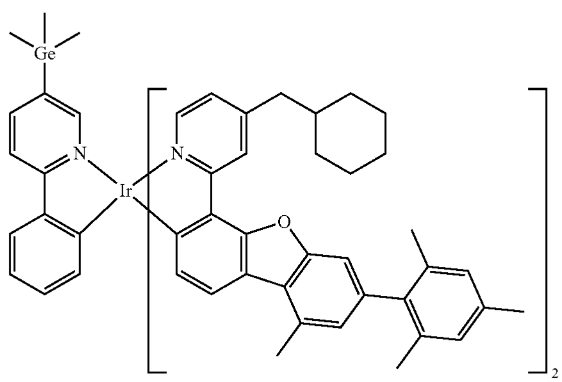
3661
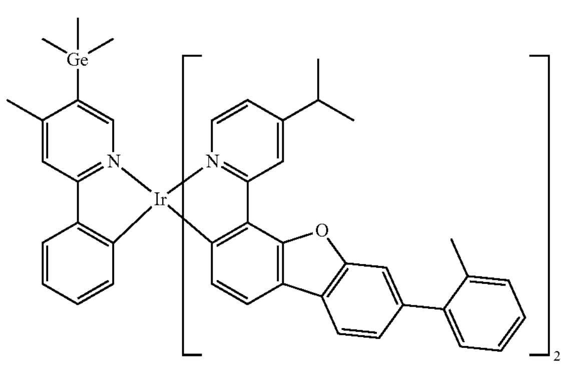

-continued
3662
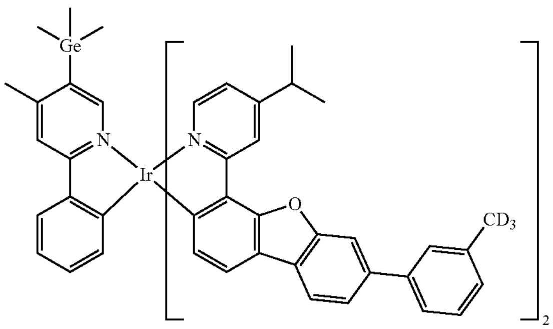
3663
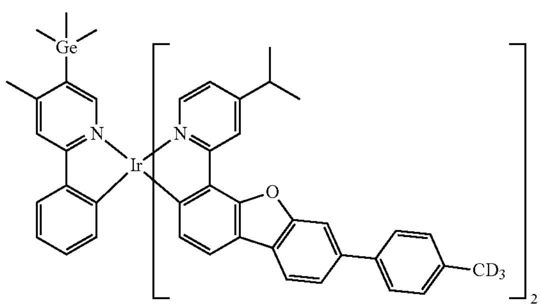
3664
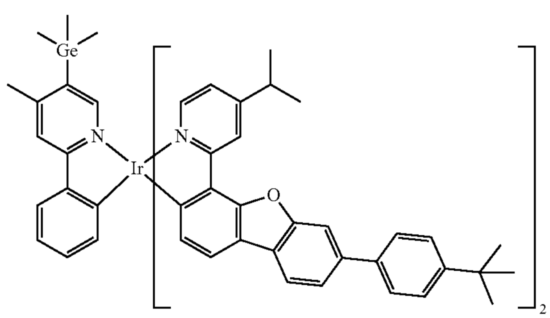
3665
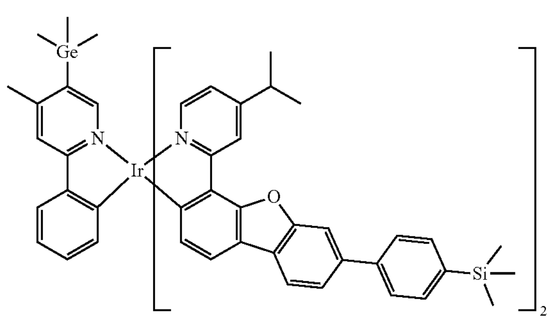

-continued
3666
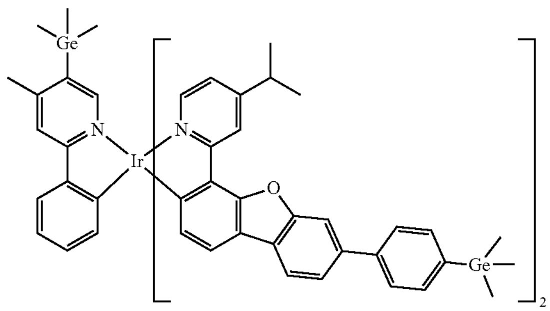
3667
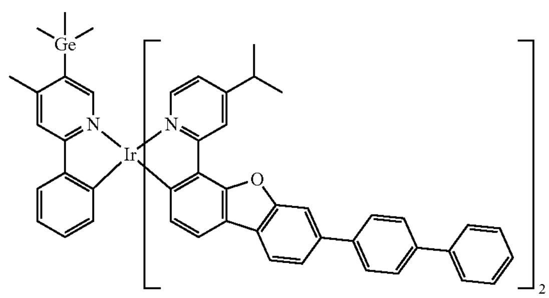
3668
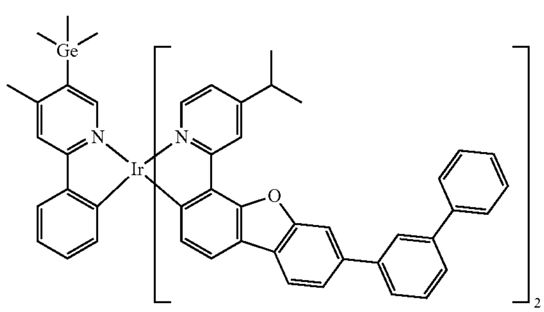
3669
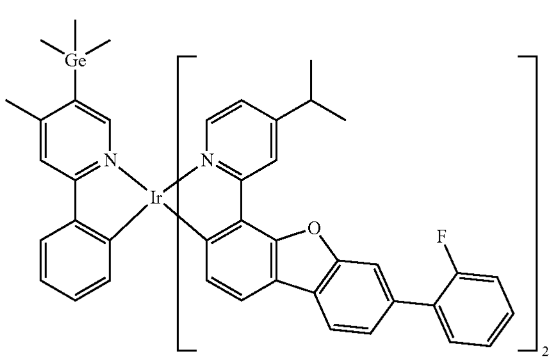

-continued
3670
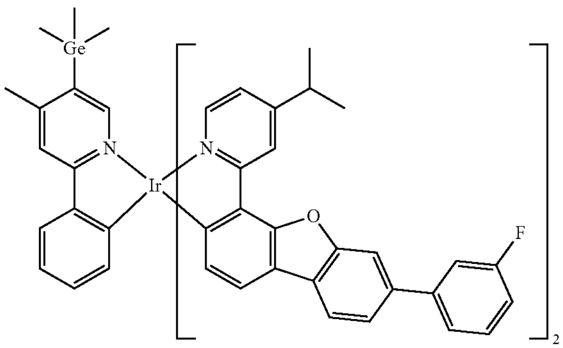
3671
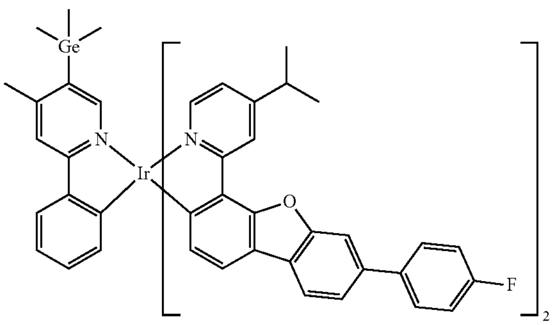
3672
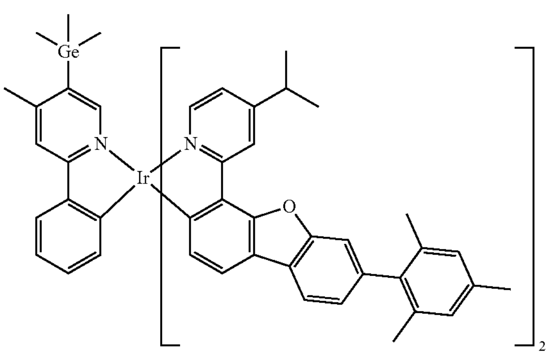
3673
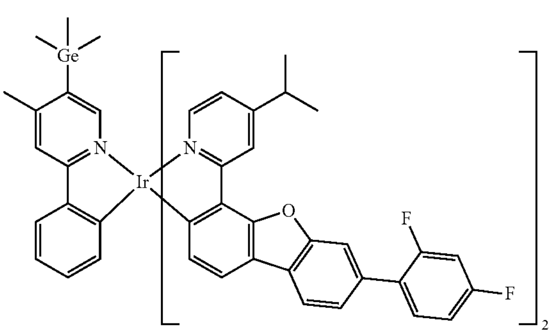

-continued
3674
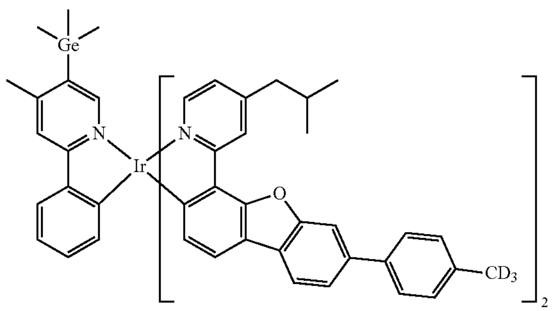
3675
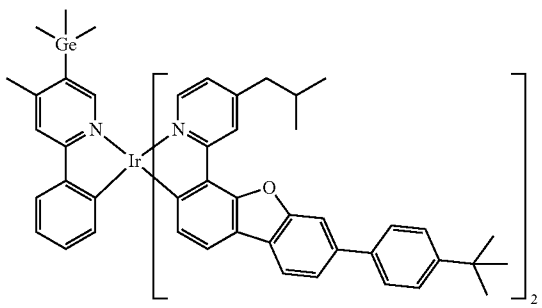
3676
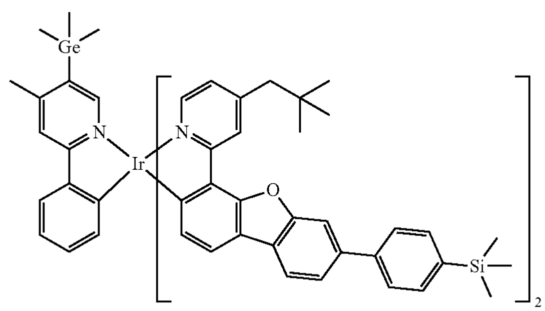
3677
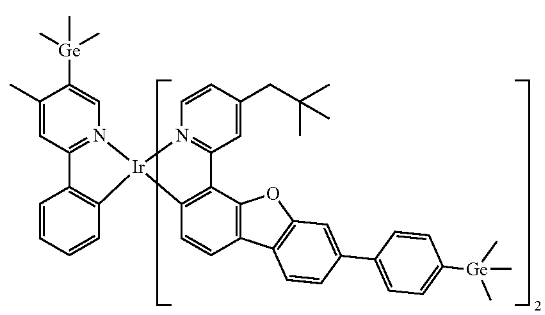
3678
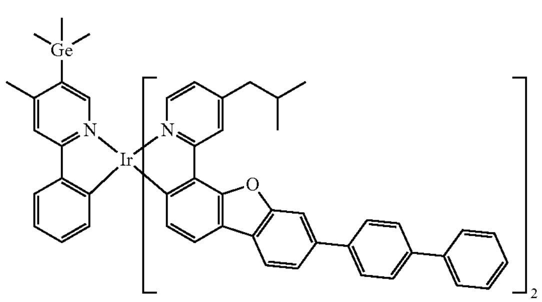

-continued
3679
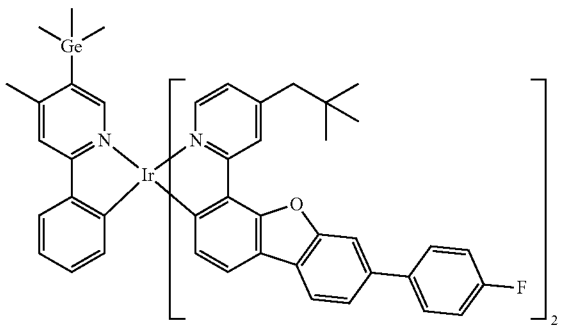
3680
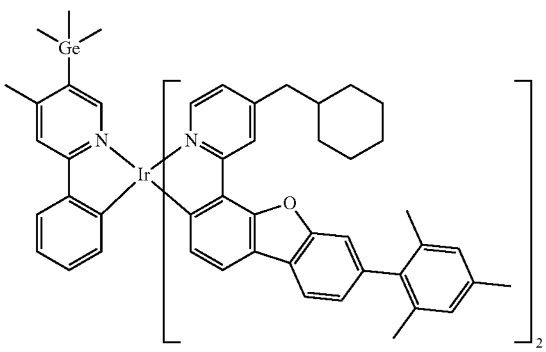
3681
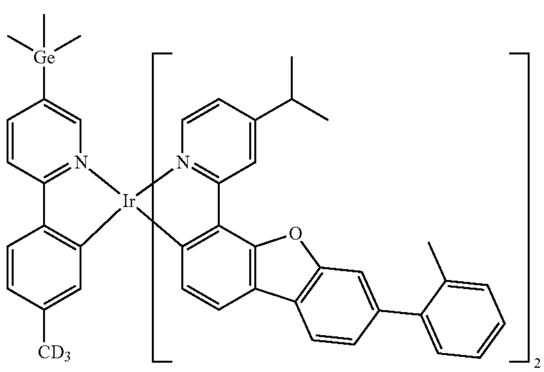
3682
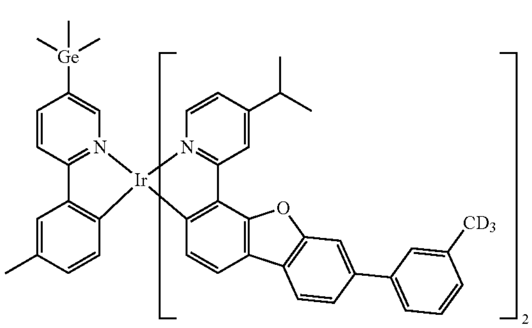

3683
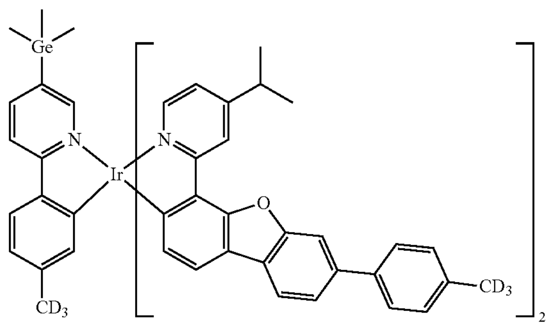
3684
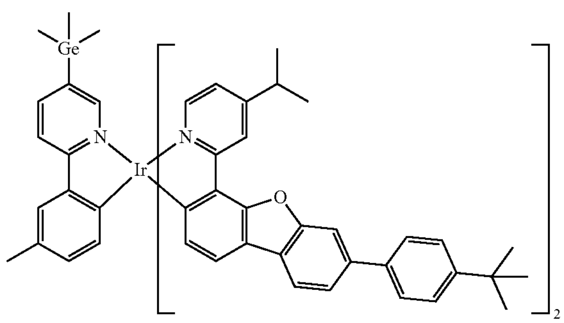
3685
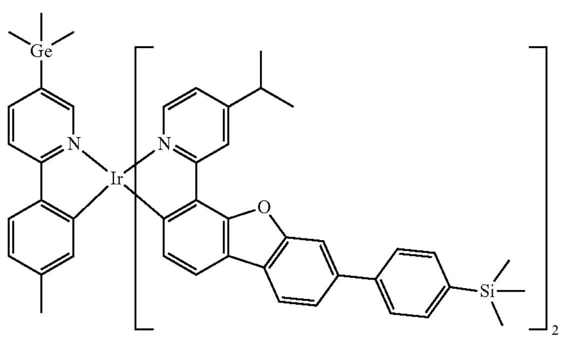
3686
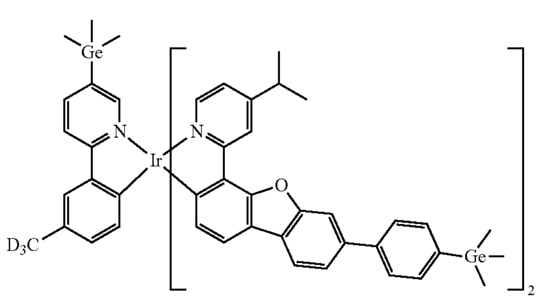

-continued
3687
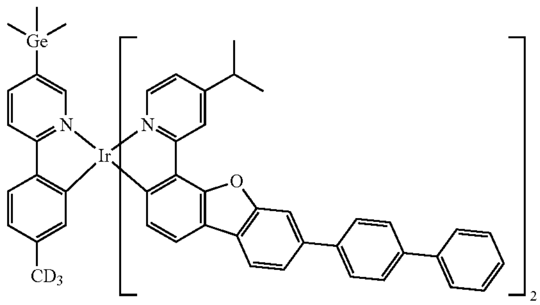
3688
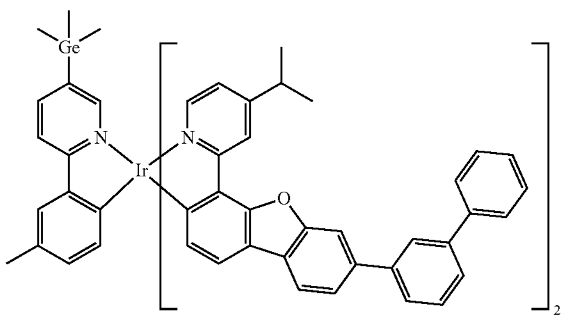
3689
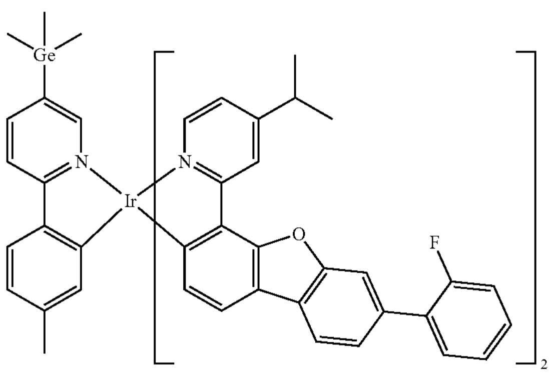
3690
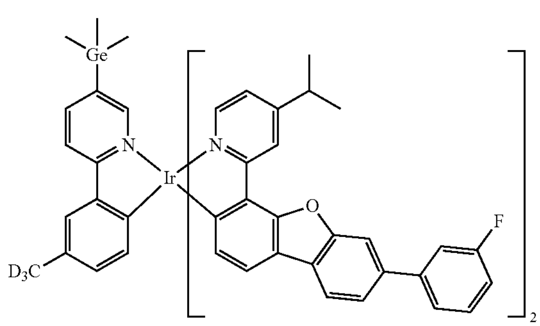

-continued
3691
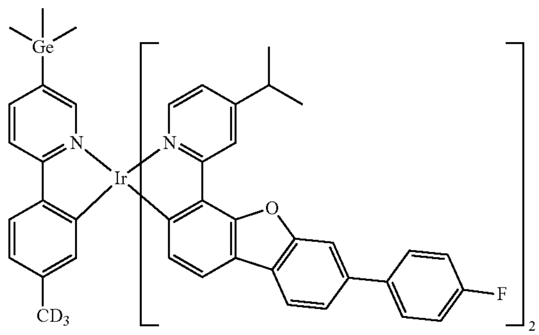
3692
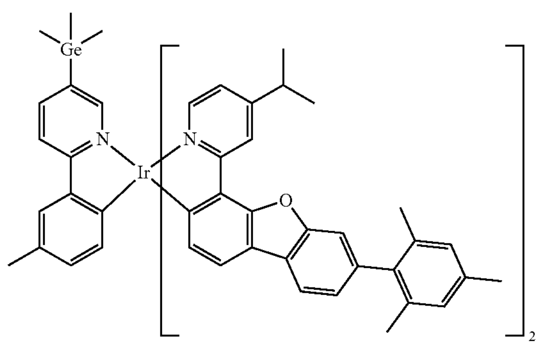
3693
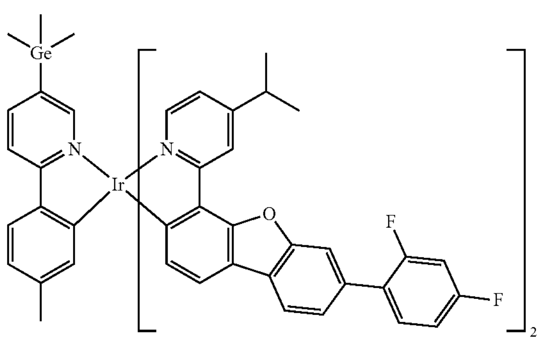
3694
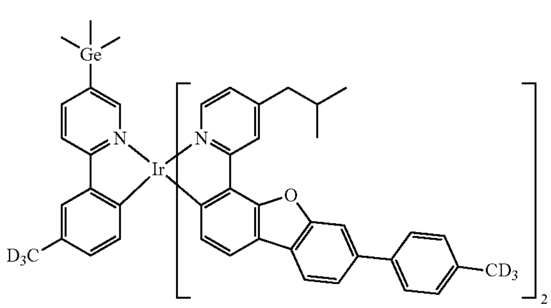

-continued
3695
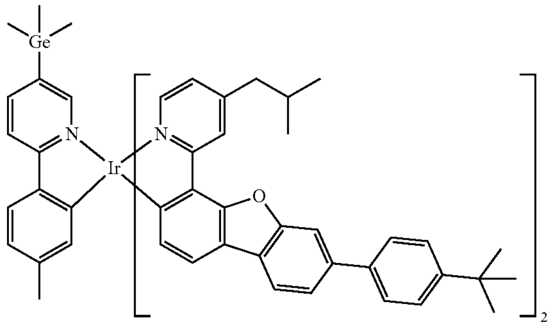
3696
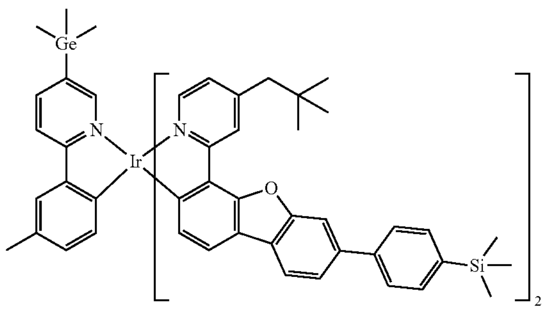
3697
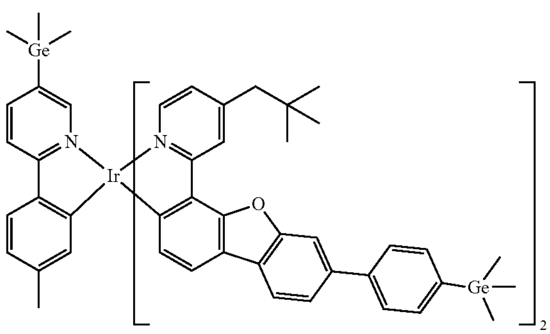
3698
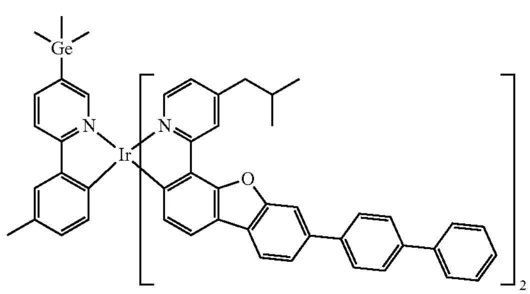

-continued
3699
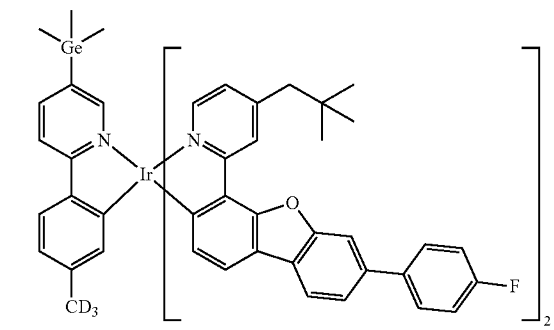
3700
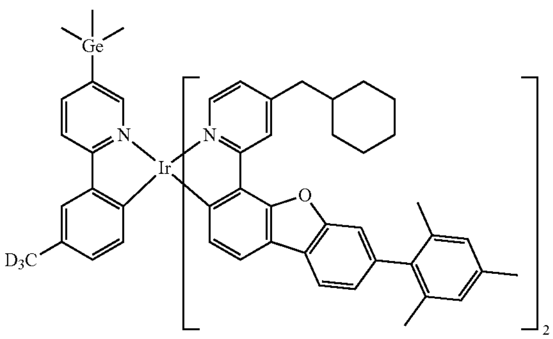
3701
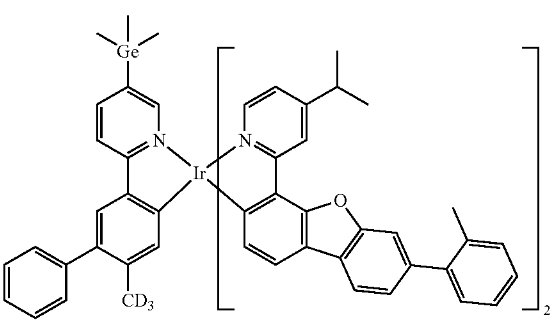
3702
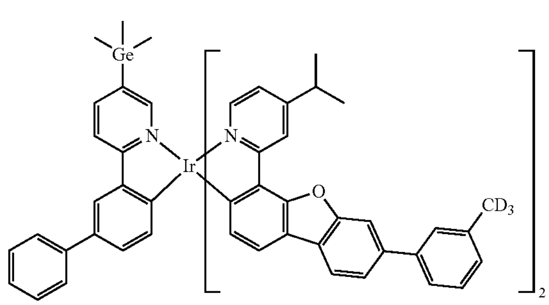

-continued
3703
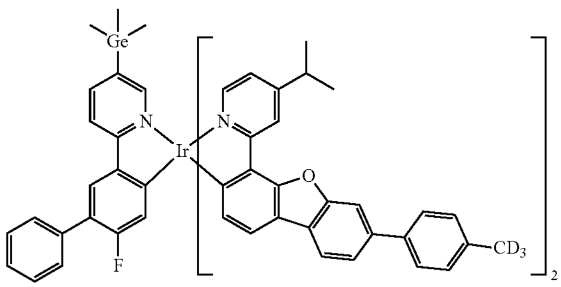
3704
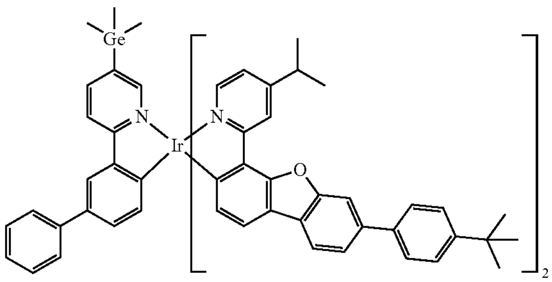
3705
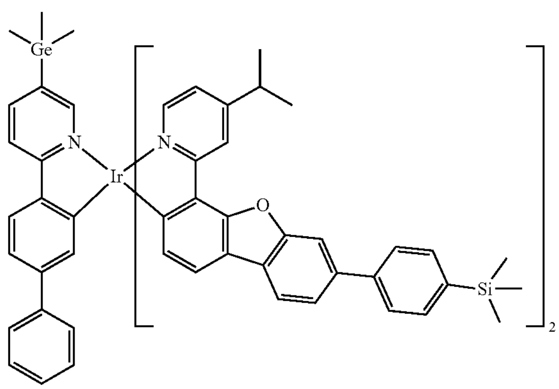
3706
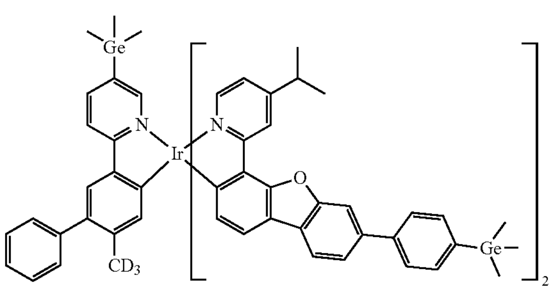
3707
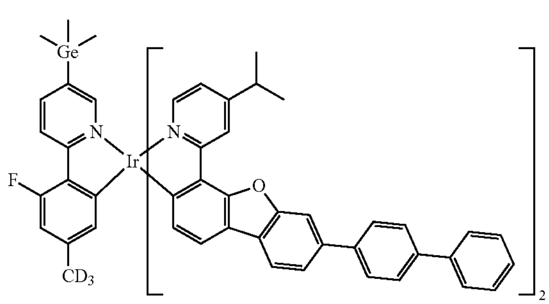

-continued
3708
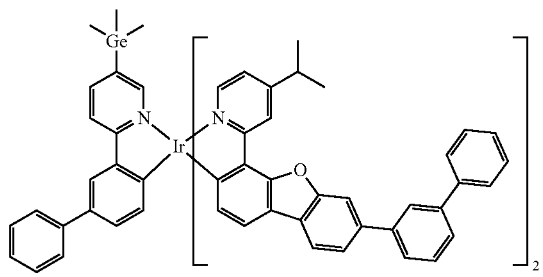
3709
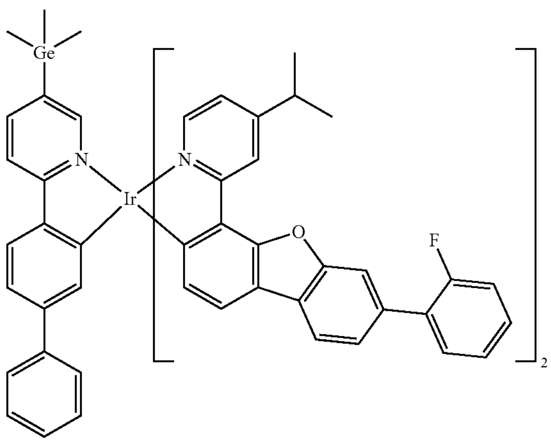
3710
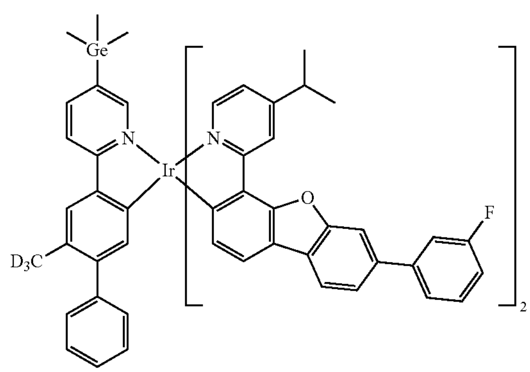
3711
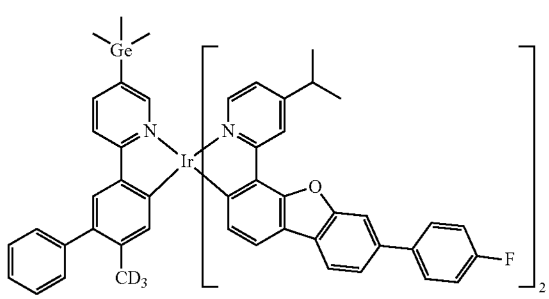

-continued
3712
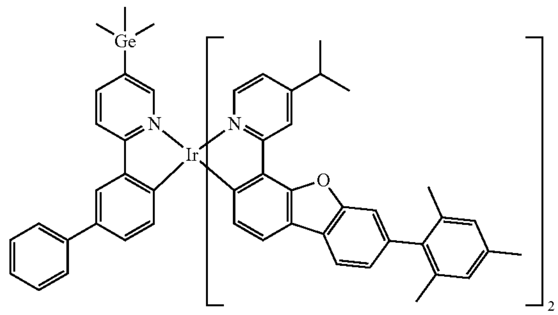
3713
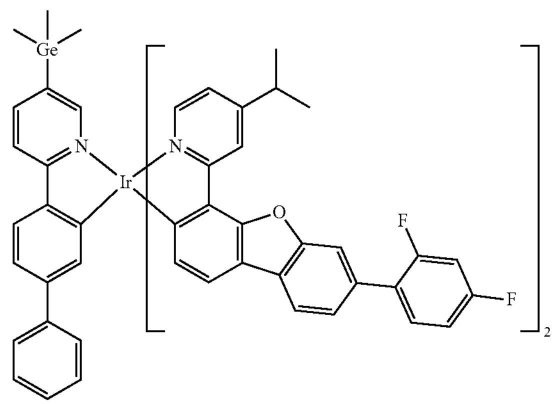
3714
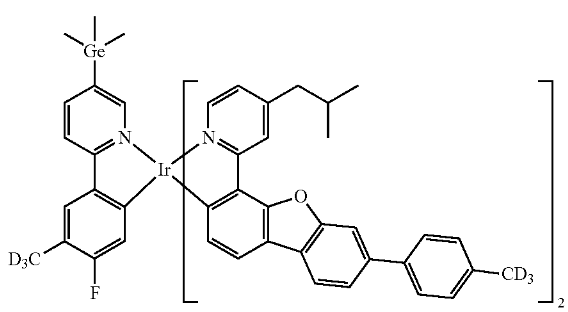
3715
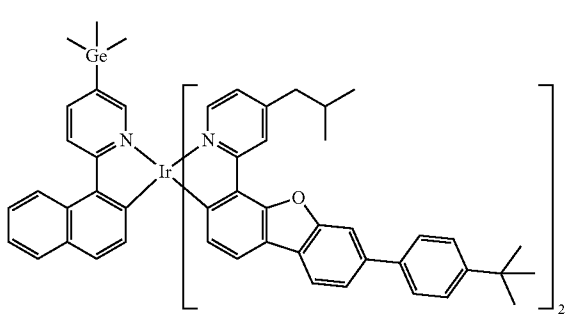

-continued
3716
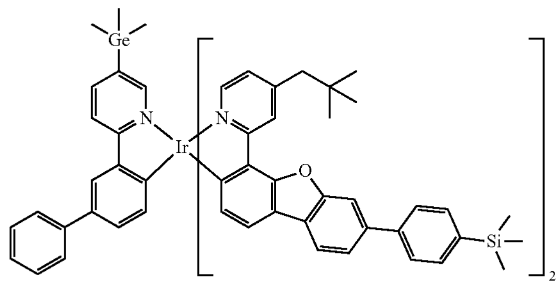
3717
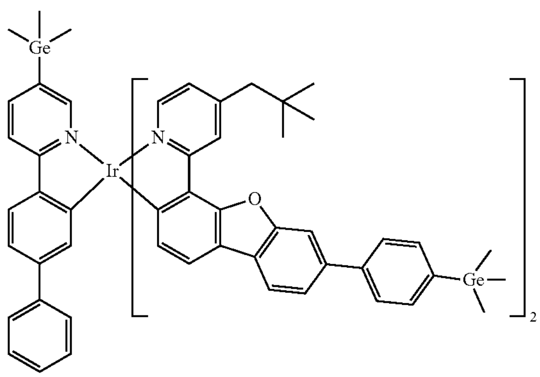
3718
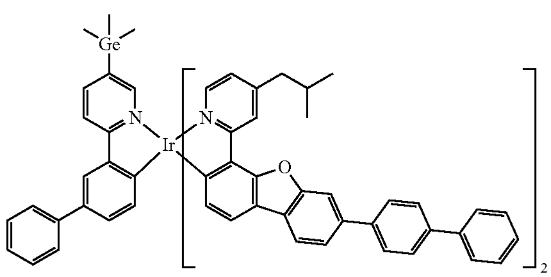
3719
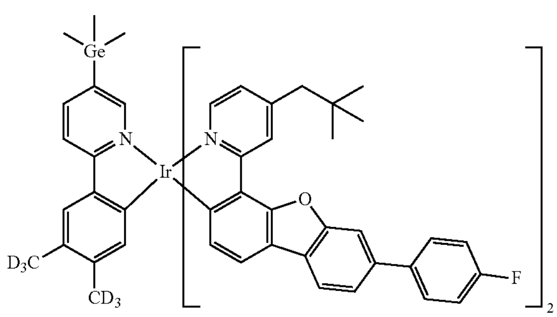

-continued
3720
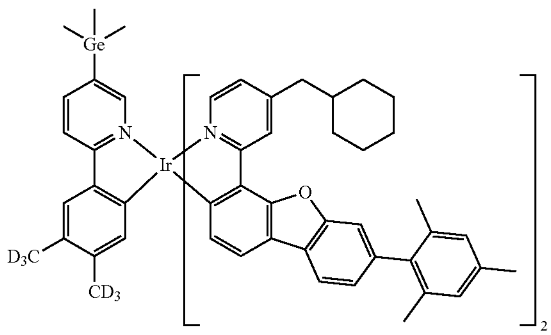
3721
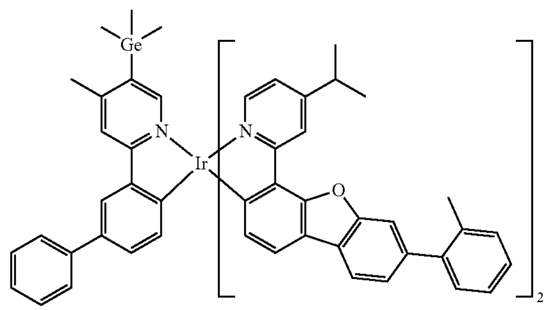
3722
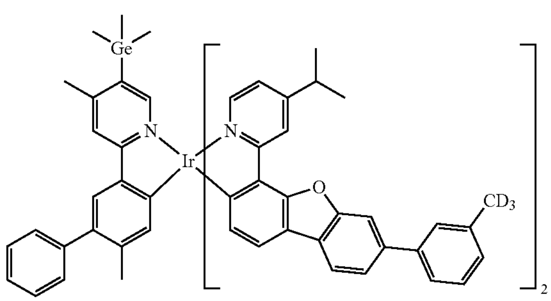
3723
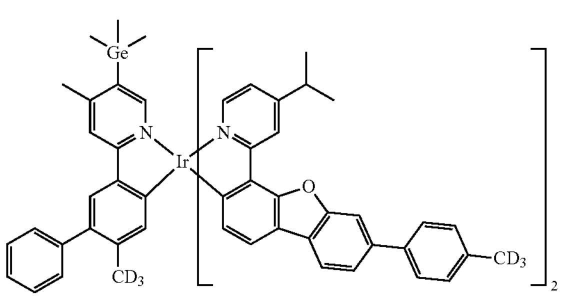

-continued
3724
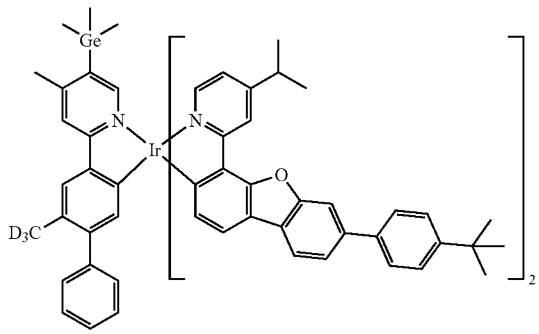
3725
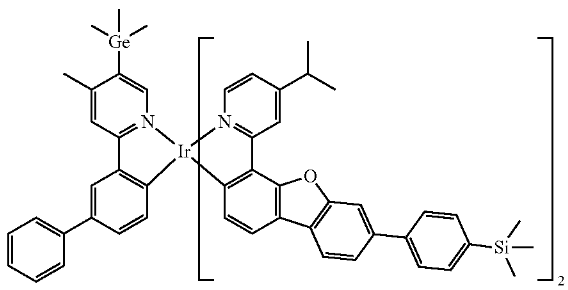
3726
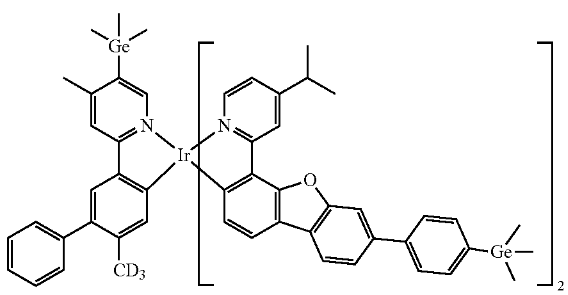
3727
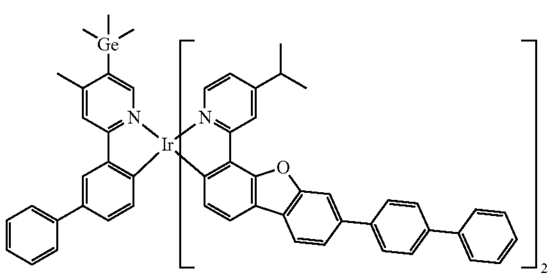
3728
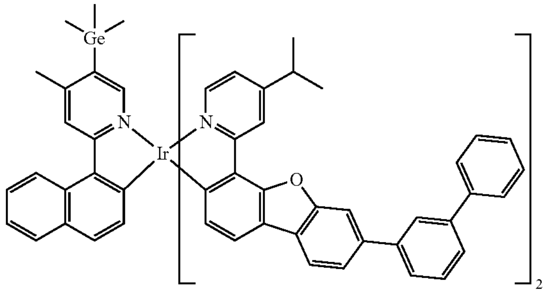

-continued
3729
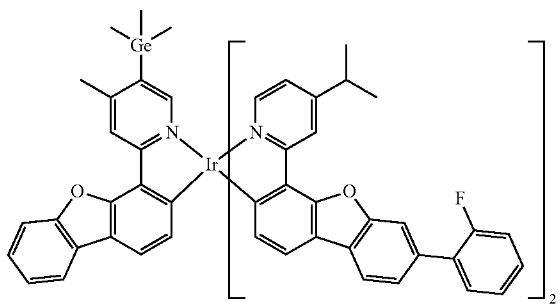
3730
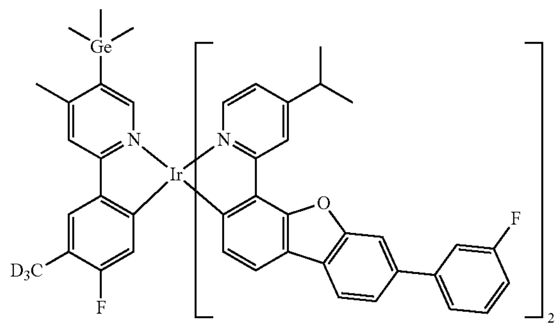
3731
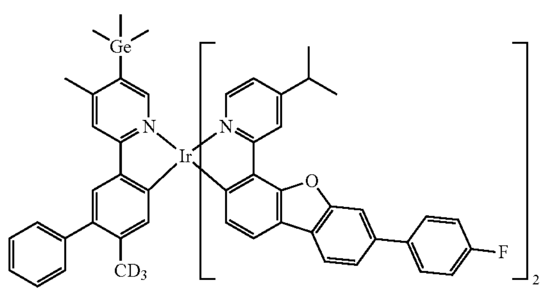
3732
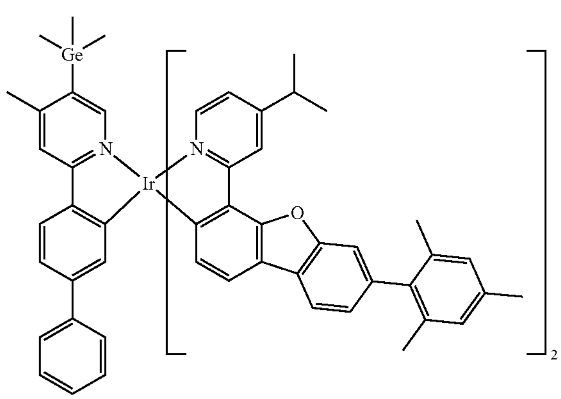

-continued
3733
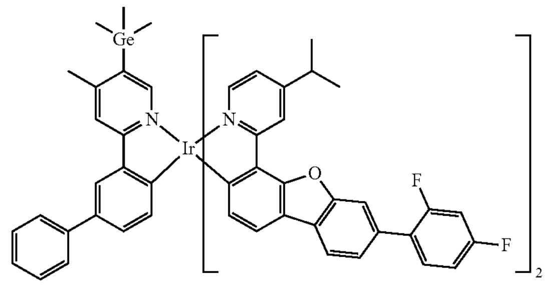
3734
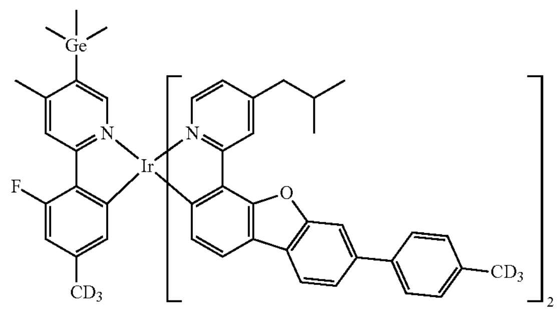
3735
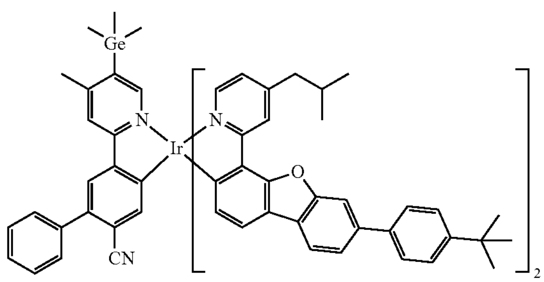
3736
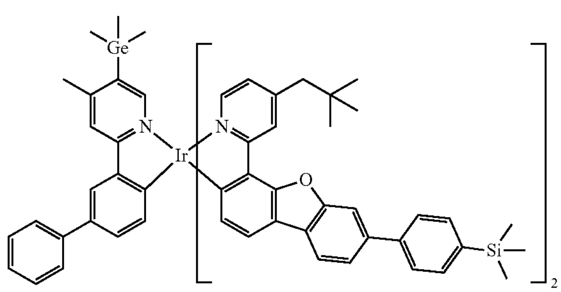
3737
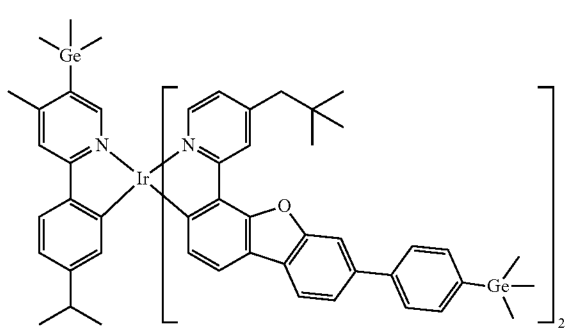

-continued
3738
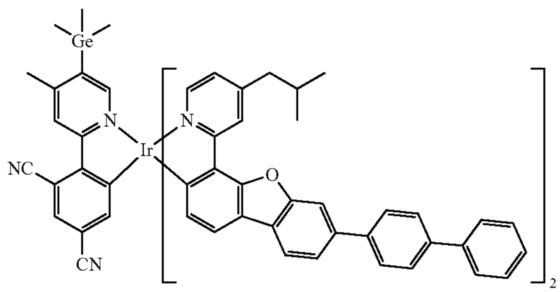
3739
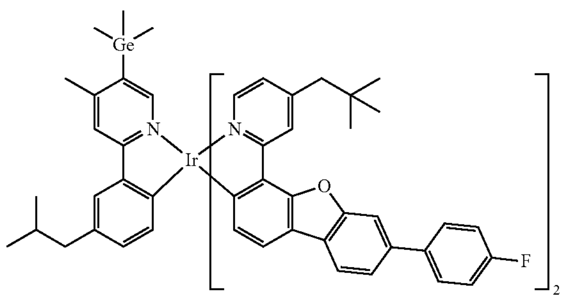
3740
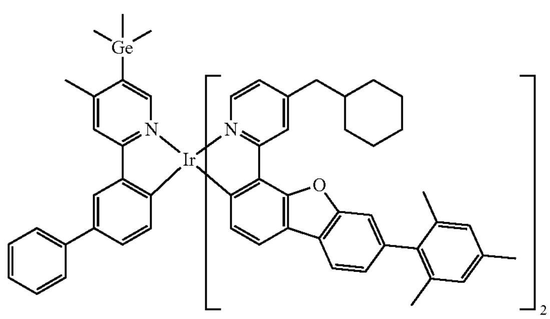
3741
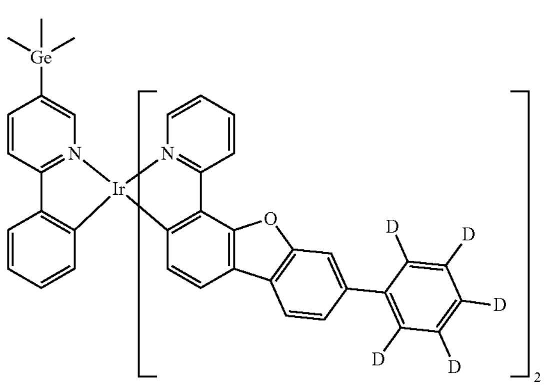

-continued
3742
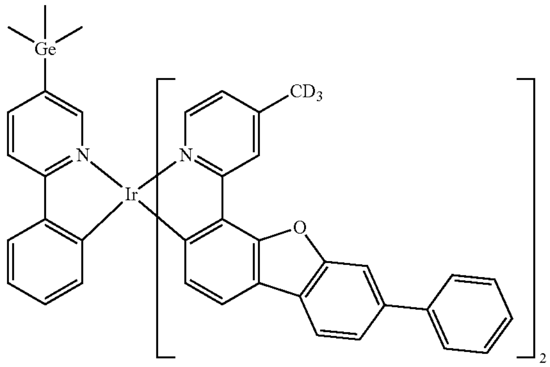
3743
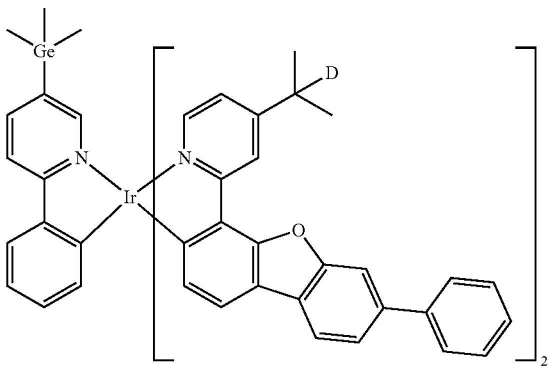
3744
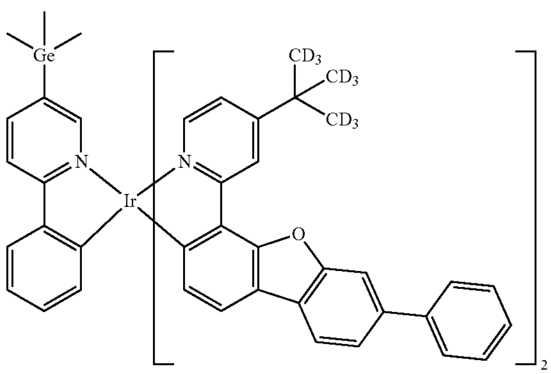
3745
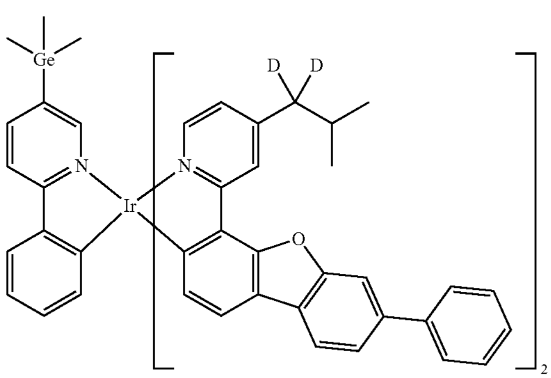

-continued
3746
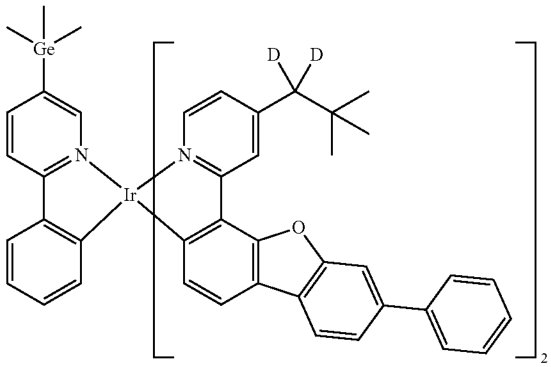
3747
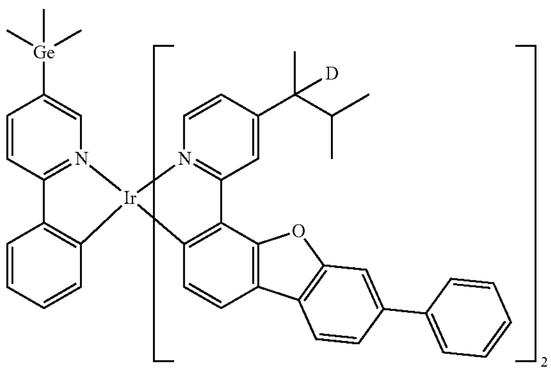
3748
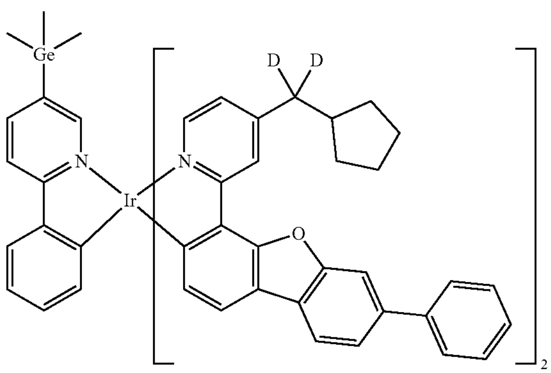
3749
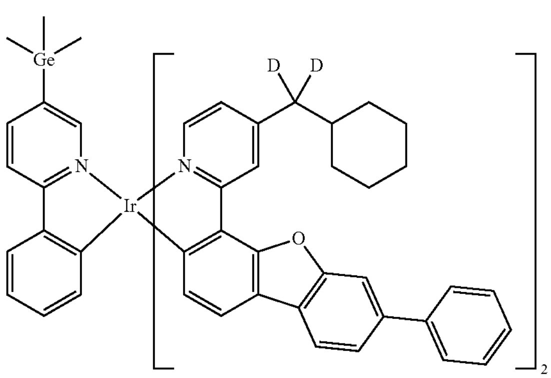

-continued
3750
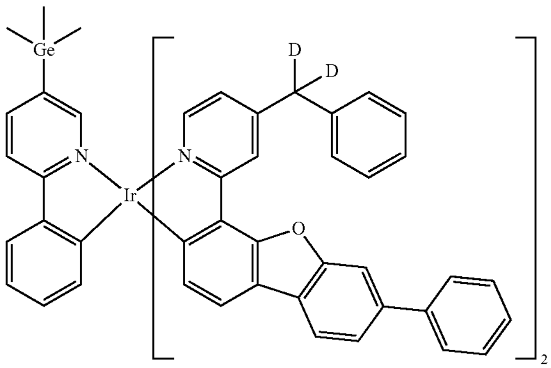
3751
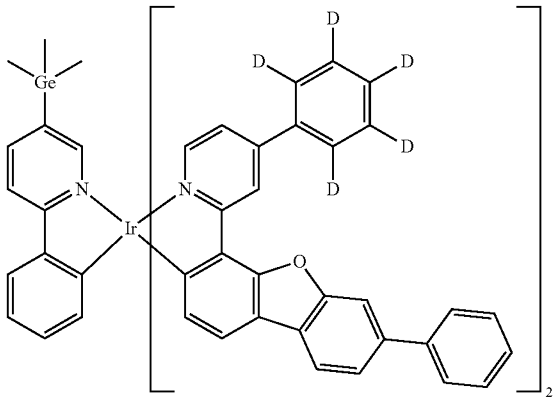
3752
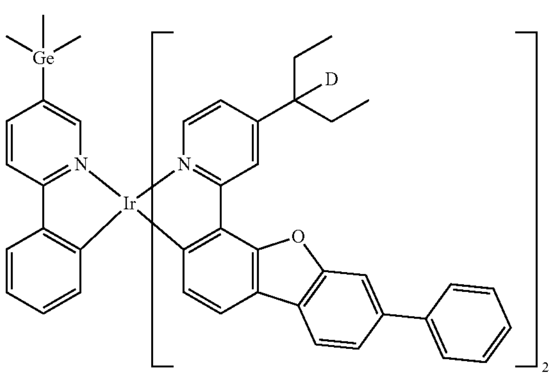
3753
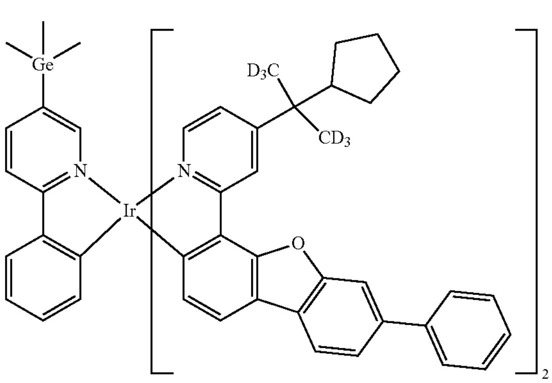

-continued
3754
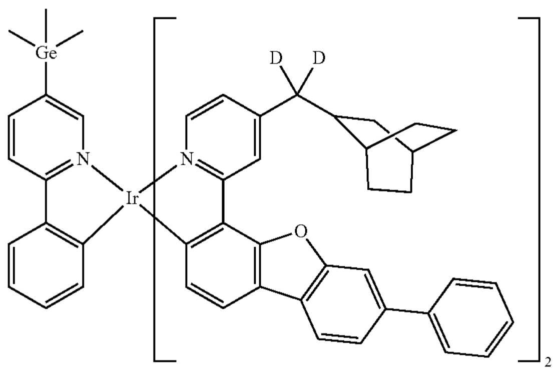
3755
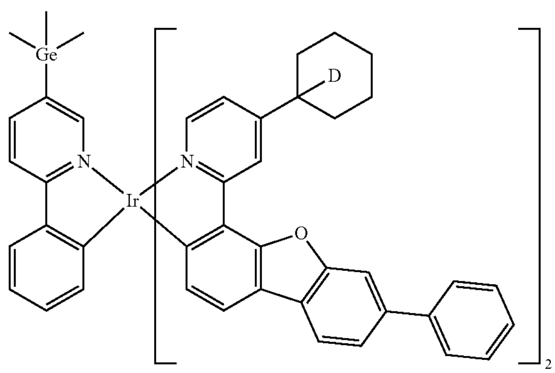
3756
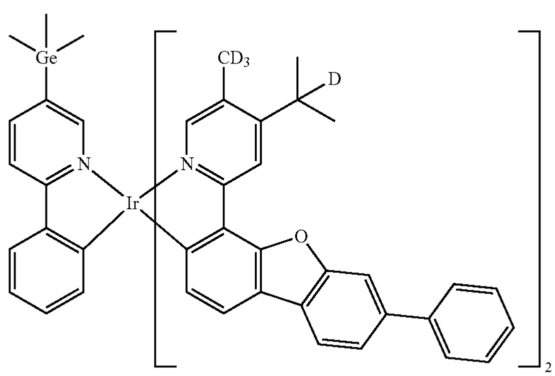
3757
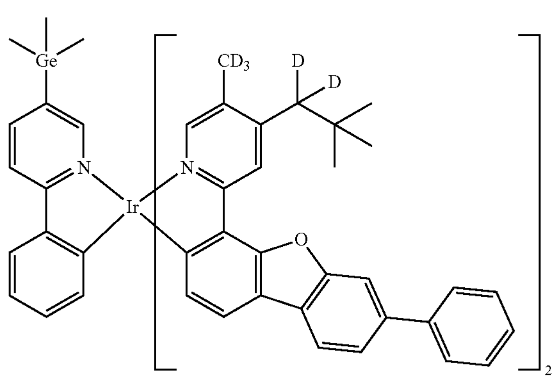

-continued
3758
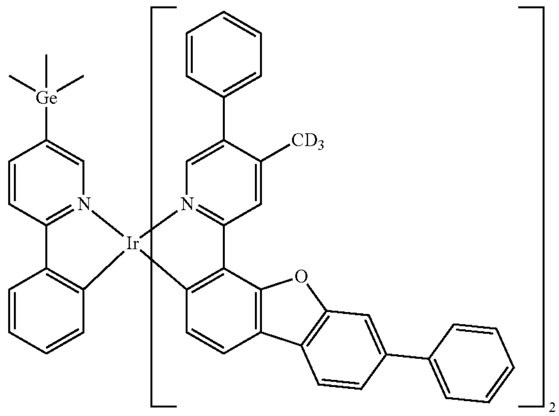
3759
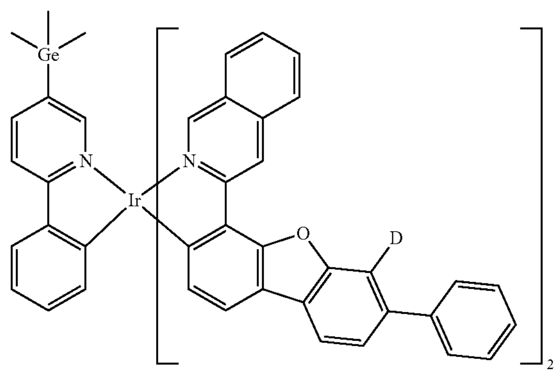
3760
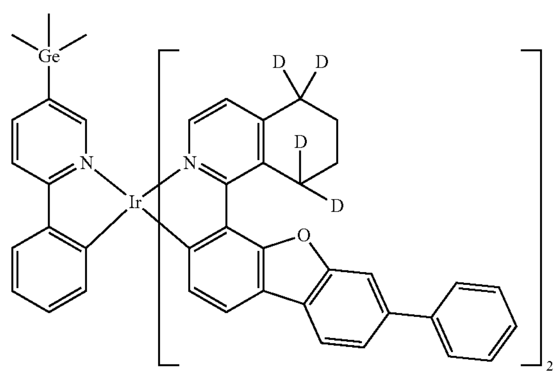
3761
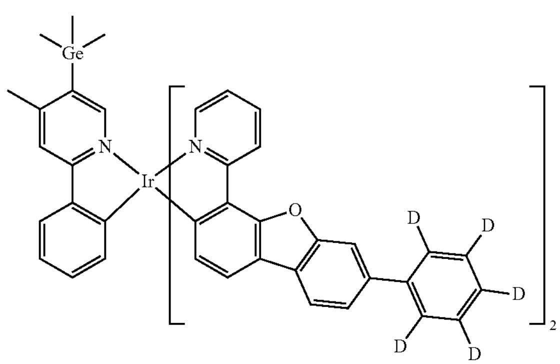

-continued
3762
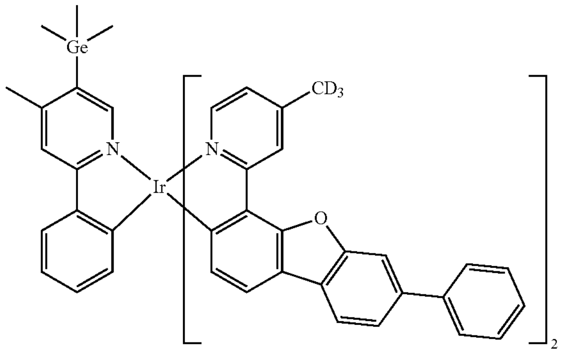
3763
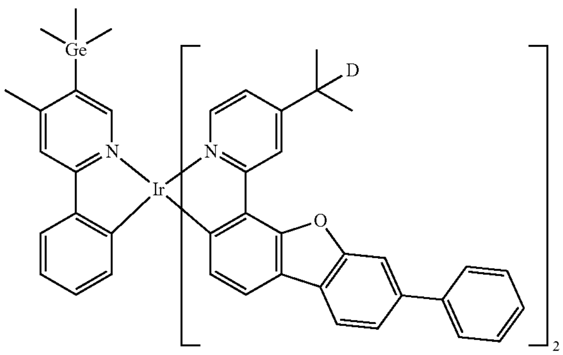
3764
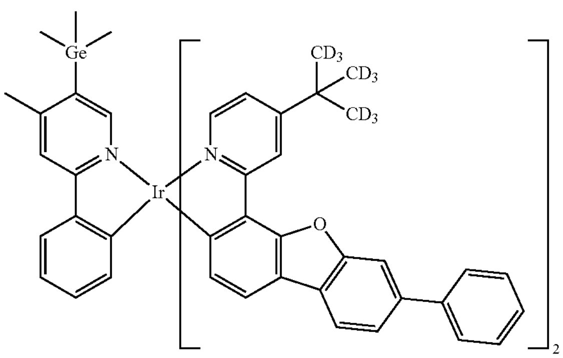
3765
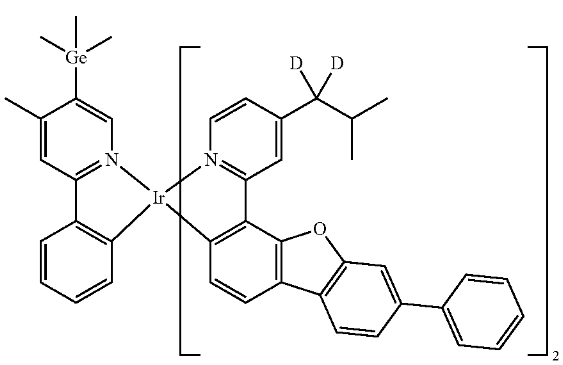

-continued
3766
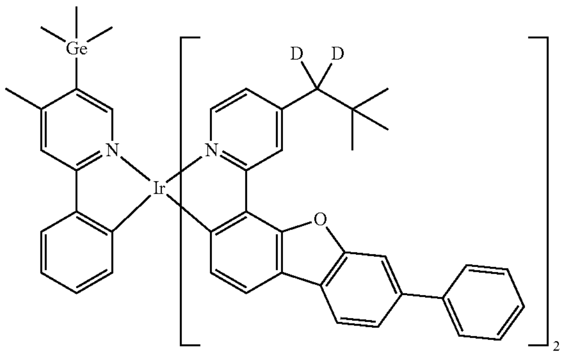
3767
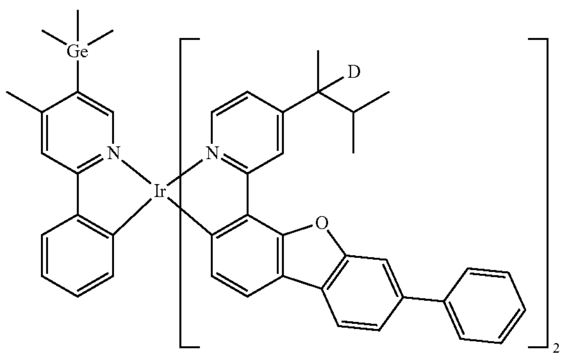
3768
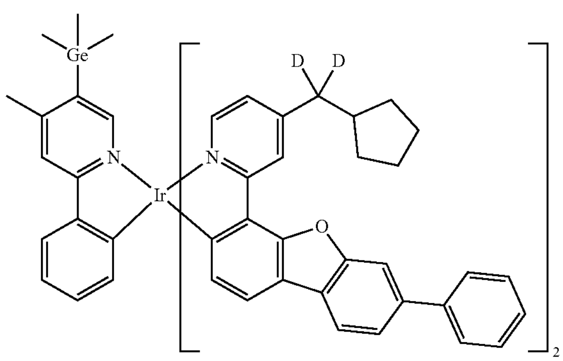
3769
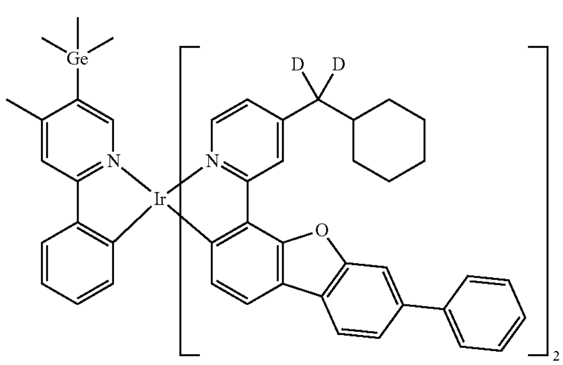

-continued
3770
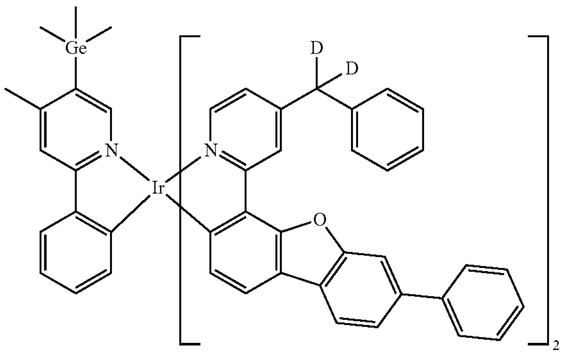
3771
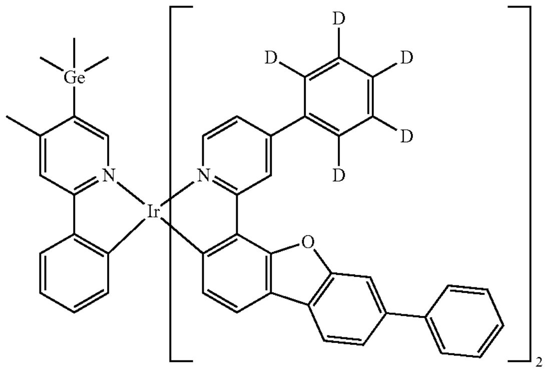
3772
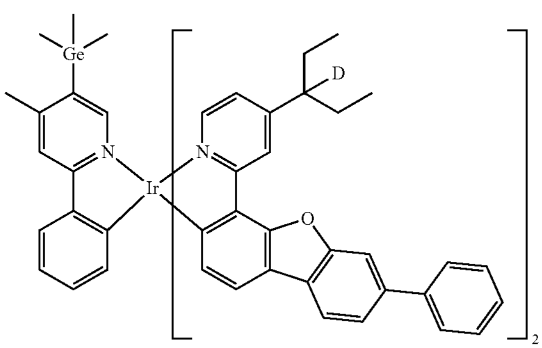
3773
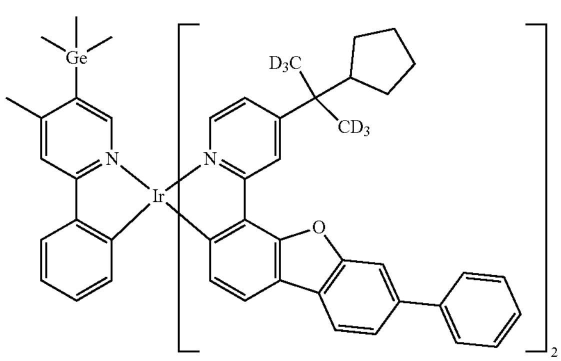

-continued
3774
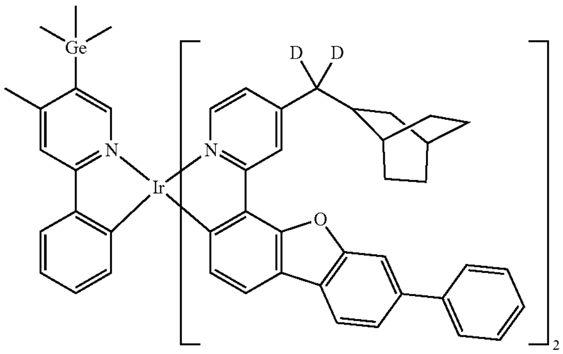
3775
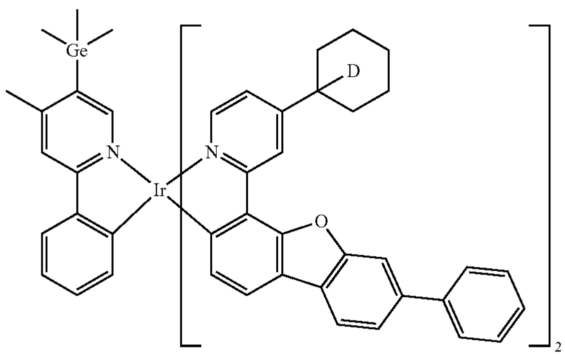
3776
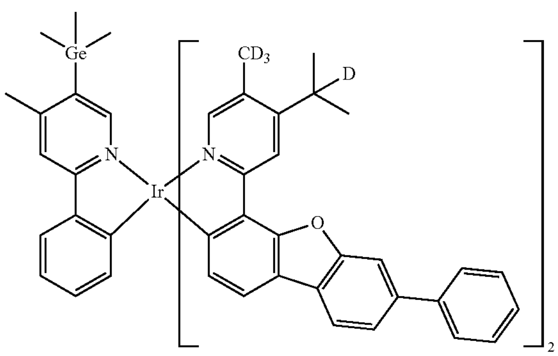
3777
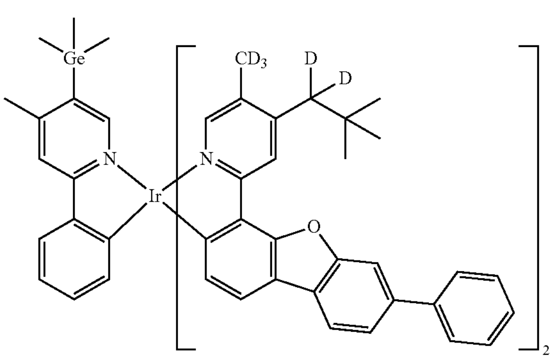

-continued
3778
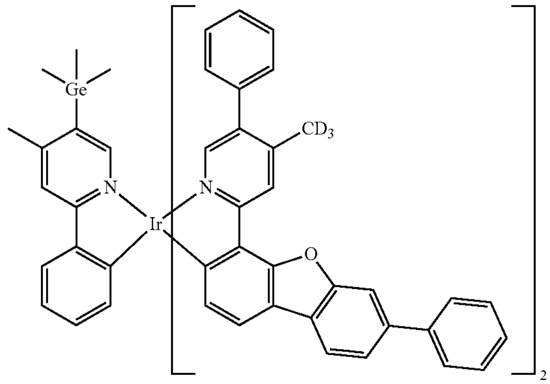
3779
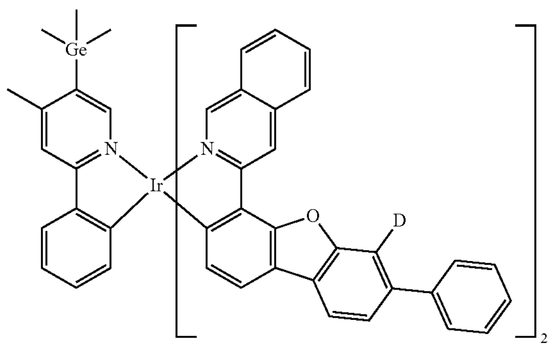
3780
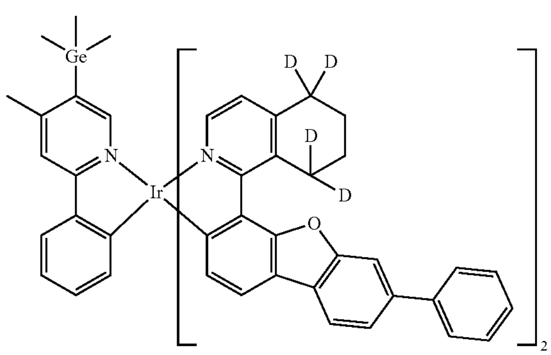
3781
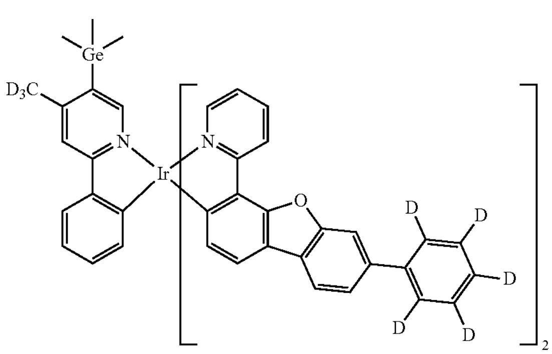

-continued
3782
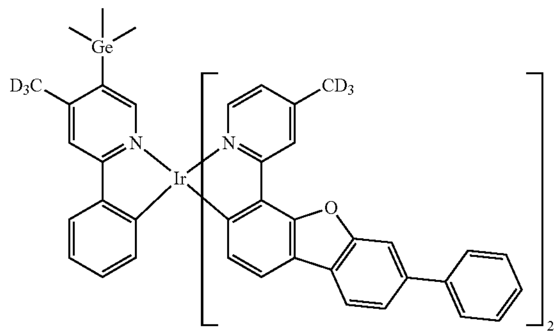
3783
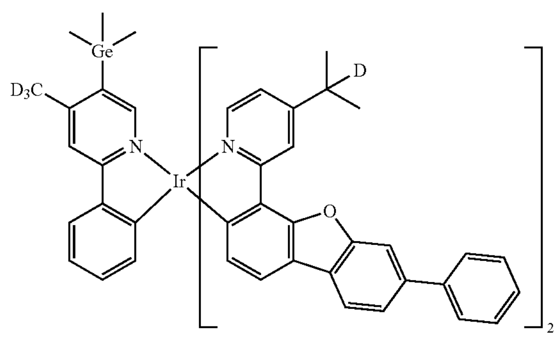
3784
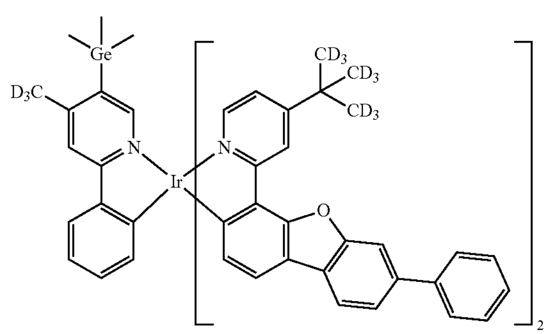
3785
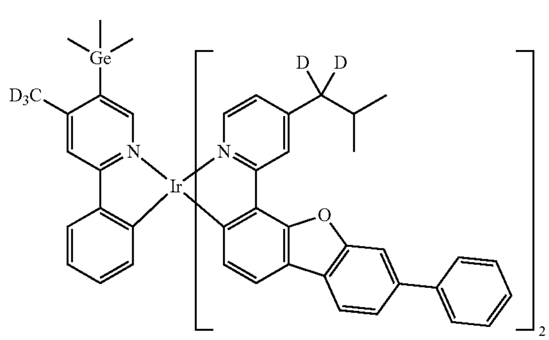

-continued
3786
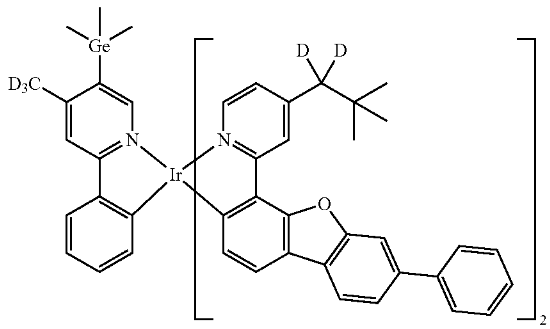
3787
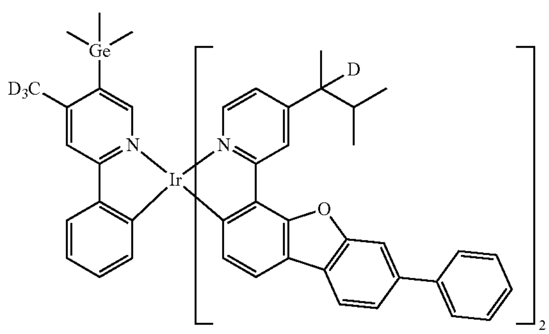
3788
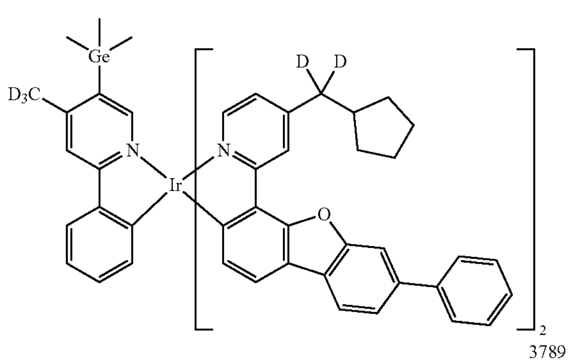
3789
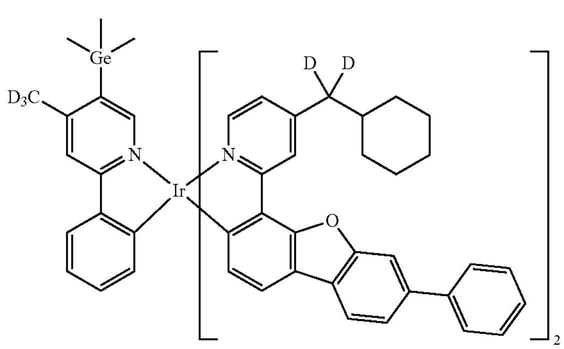

-continued
3790
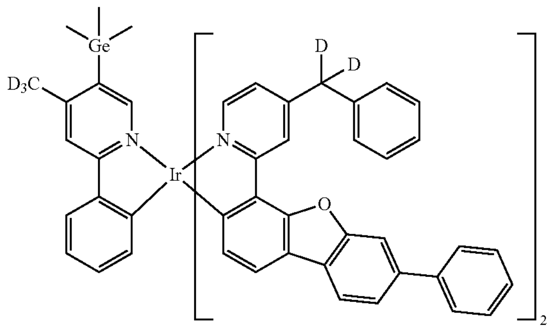
3791
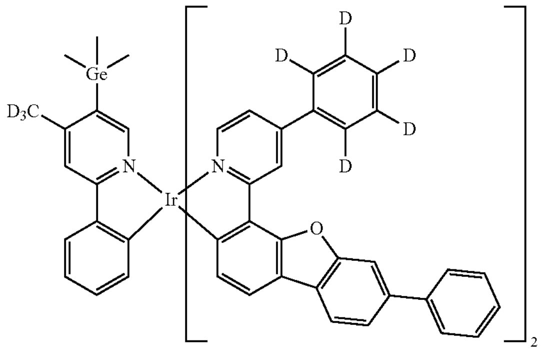
3792
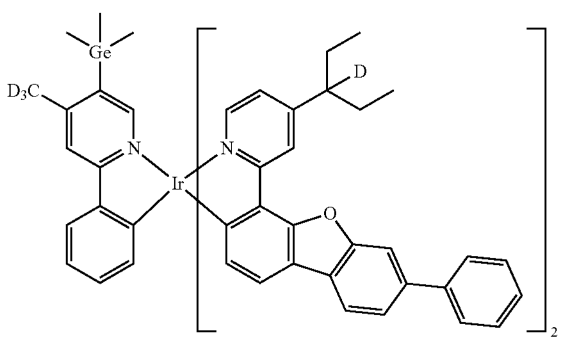
3793
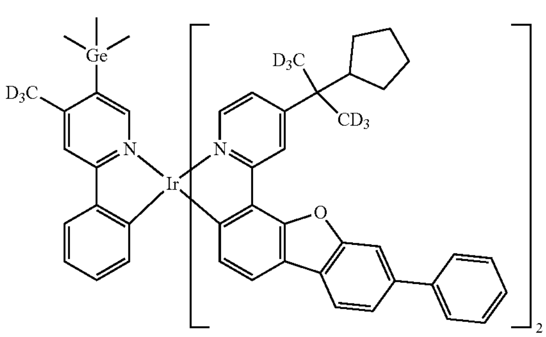

-continued
3794
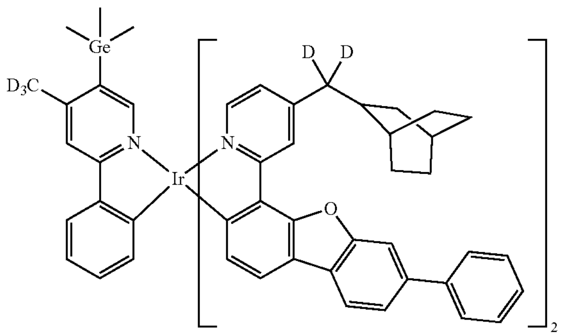
3795
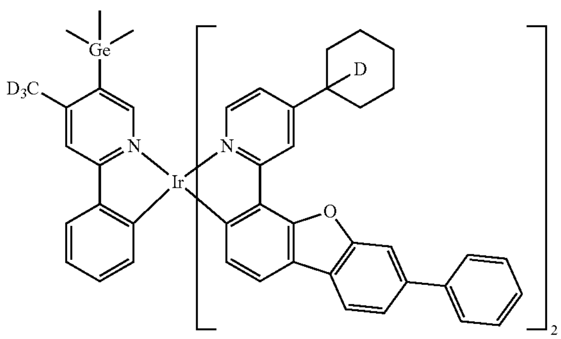
3796
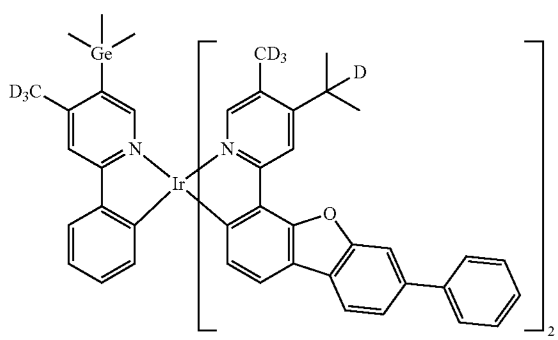
3797
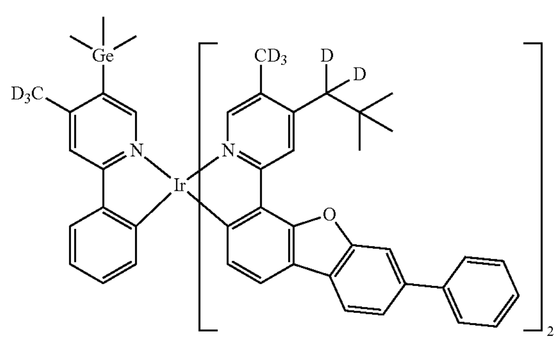

-continued
3798
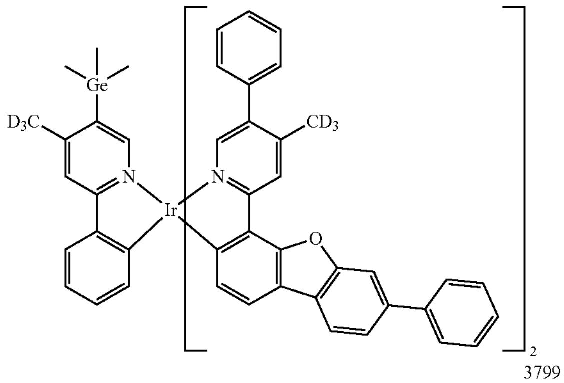
3799
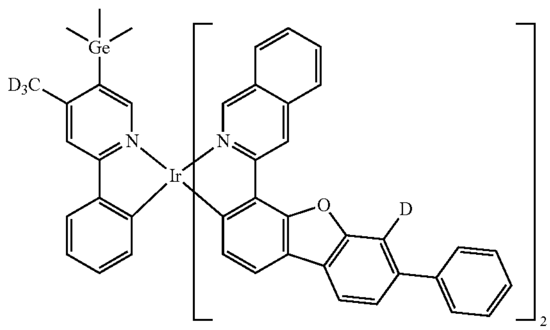
3800
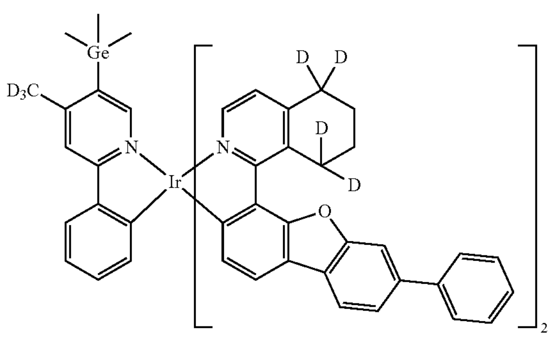
3801
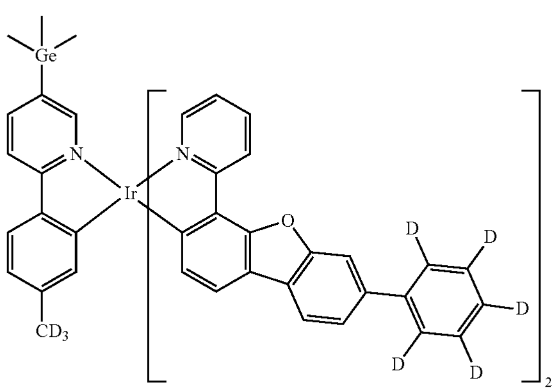
3802
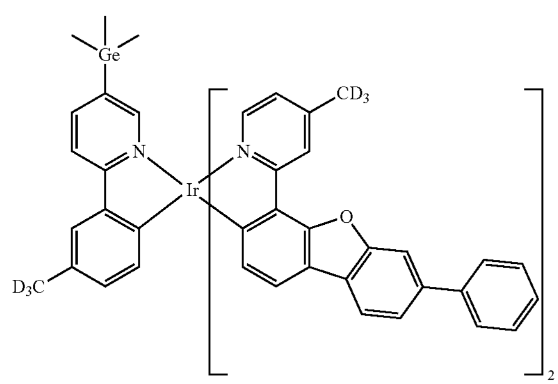

-continued
3803
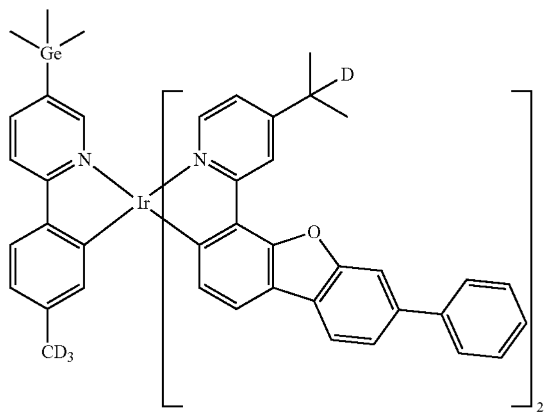
3804
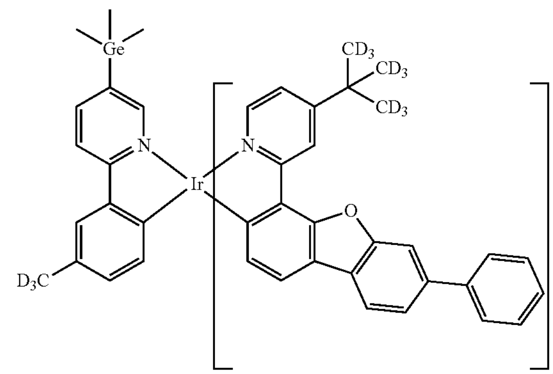
3805
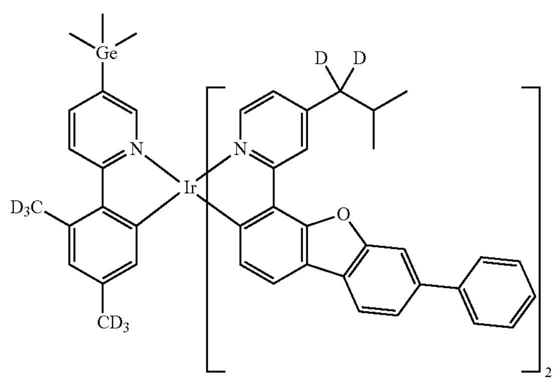
3806
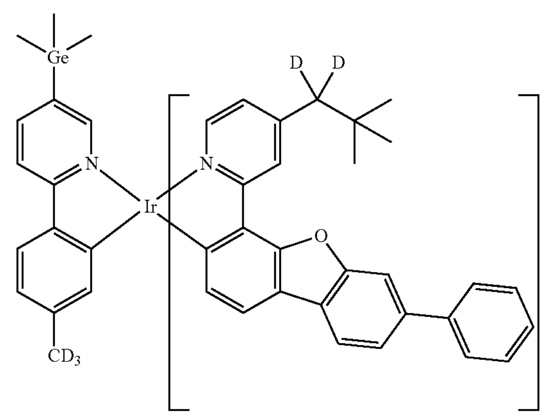
3807
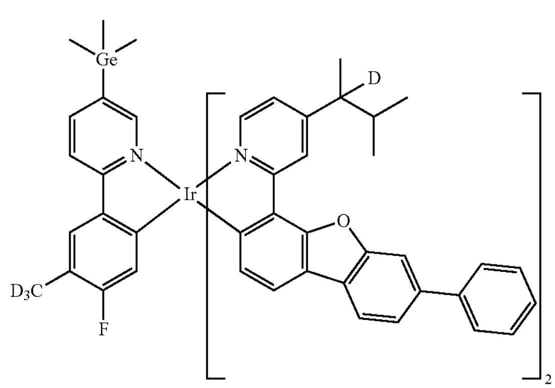
3808
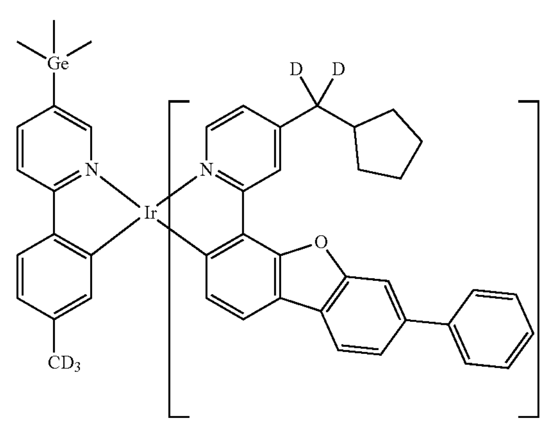

-continued
3809
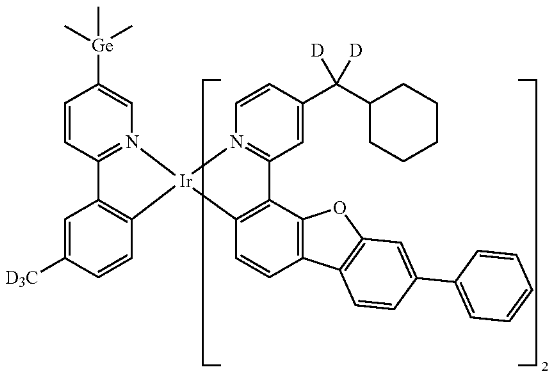
3810
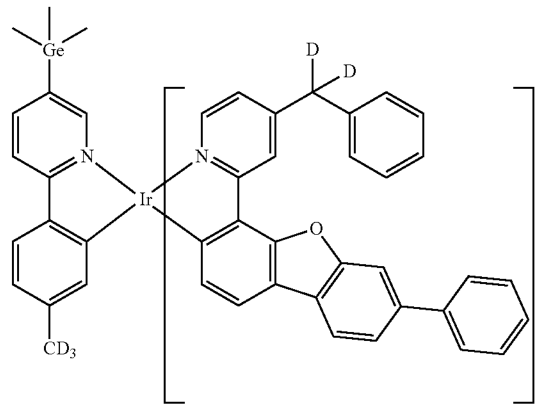
3811
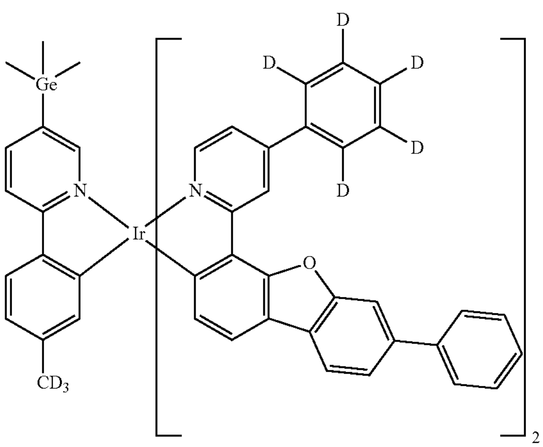
3812
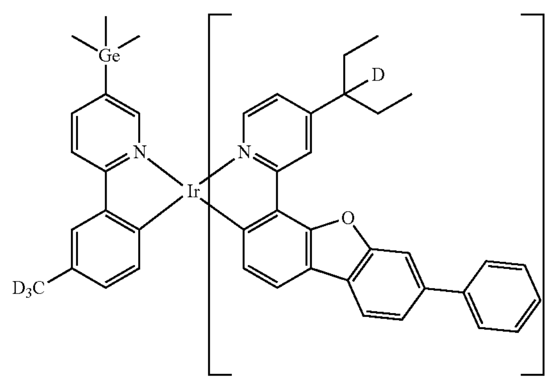
3813
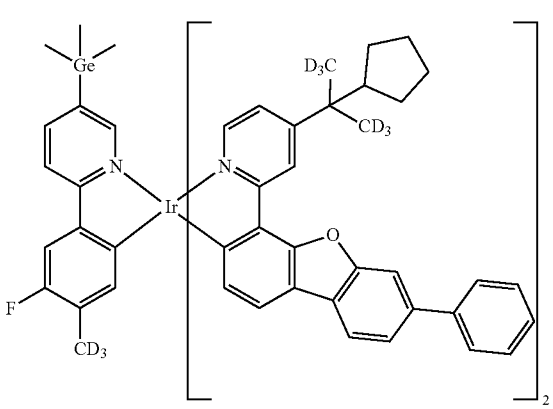
3814
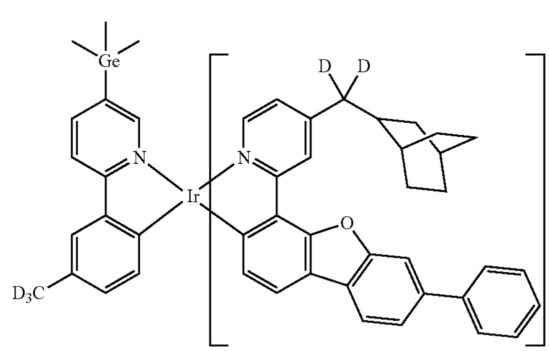

-continued
3815
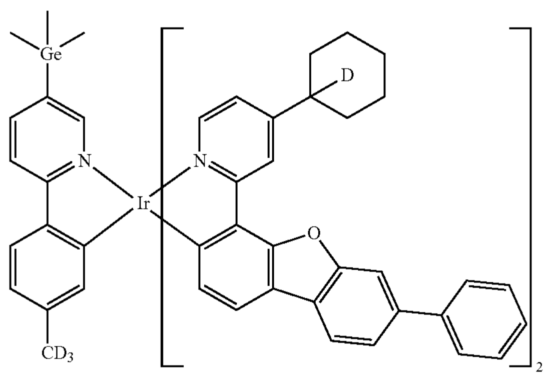
3816
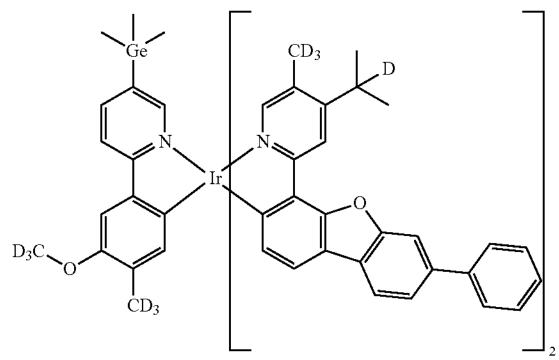
3817
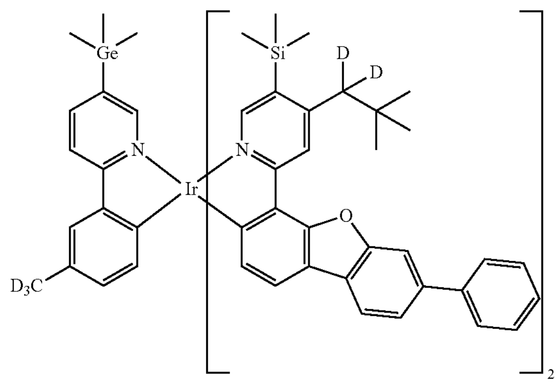
3818
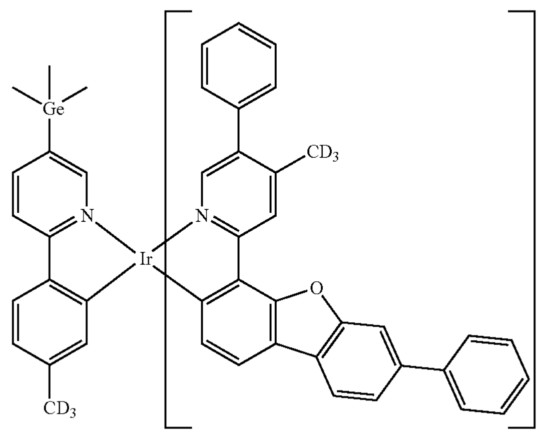
3819
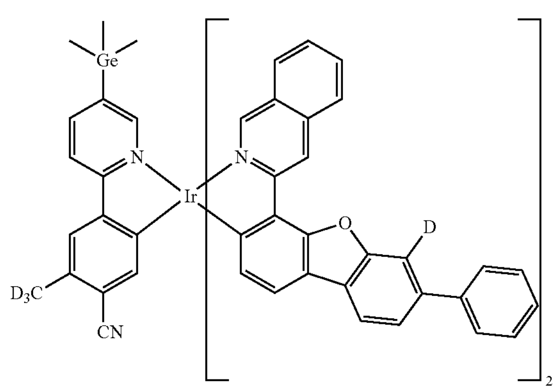
3820
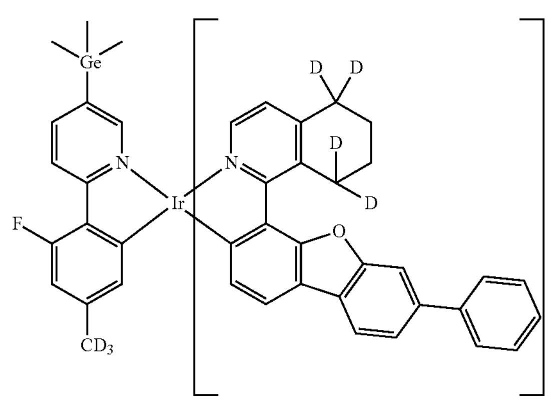

-continued
3821
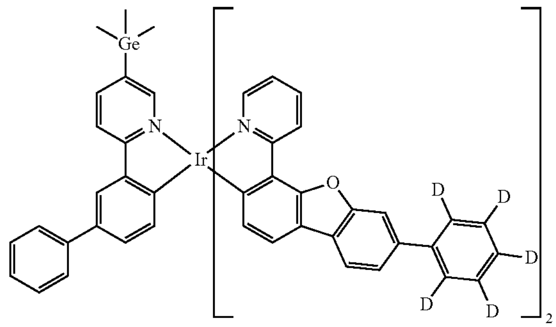
3822
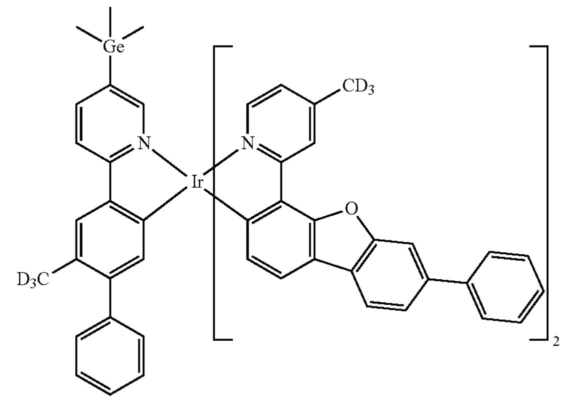
3823
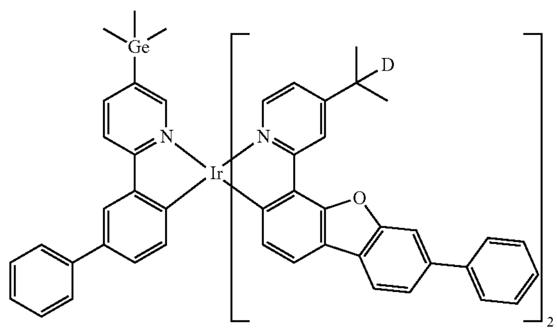
3824
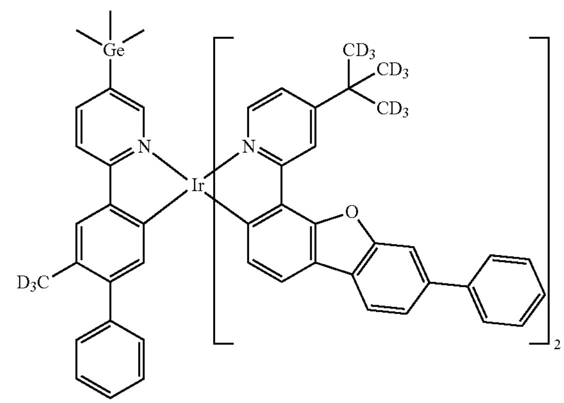
3825
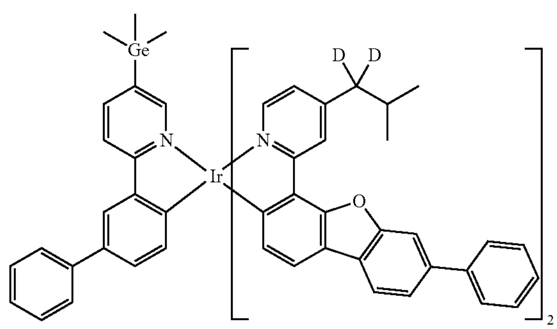
3826
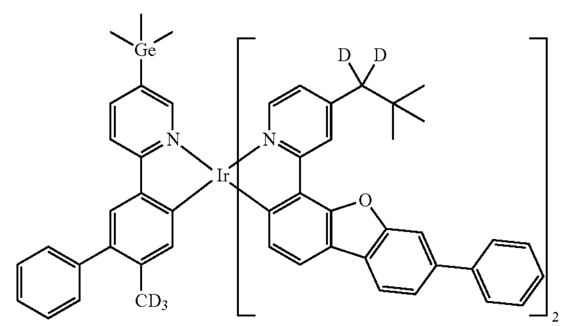
3827
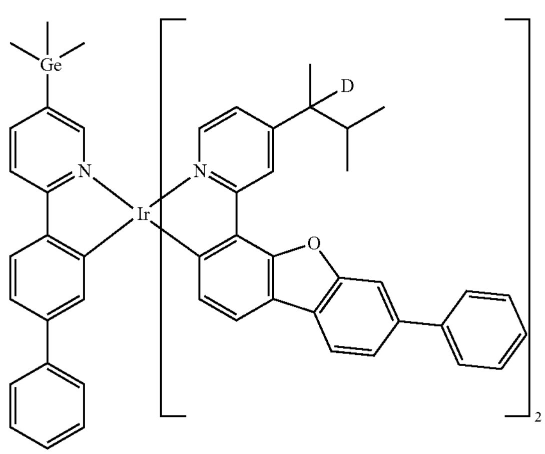
3828
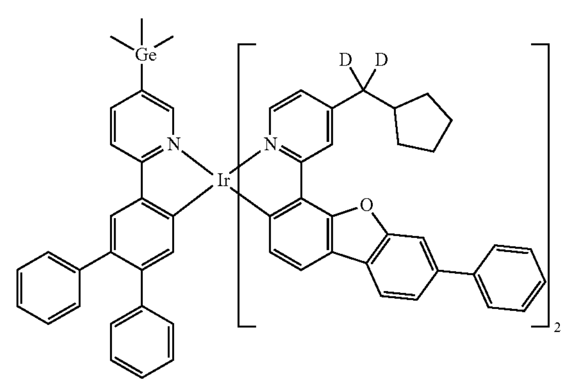

-continued
3829
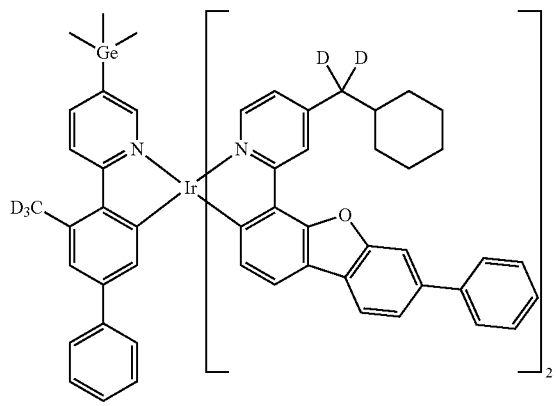
3830
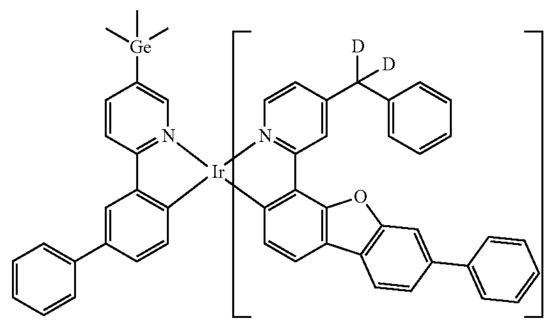
3831
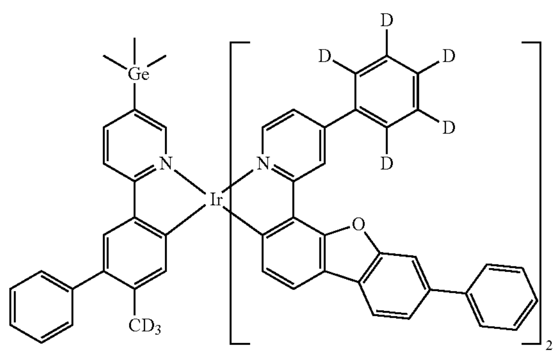
3832
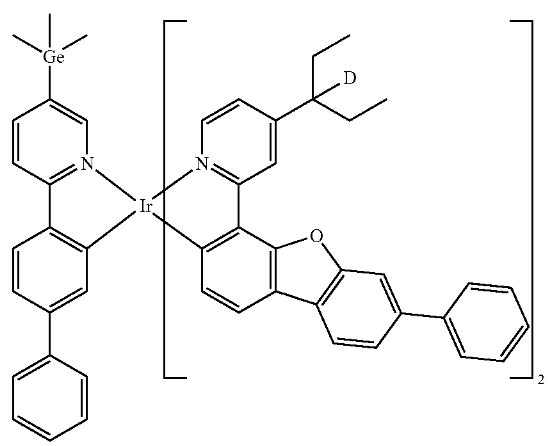
3833
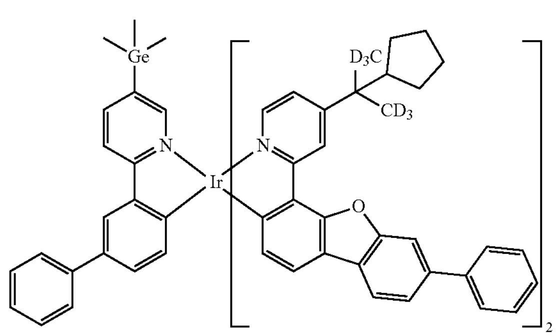
3834
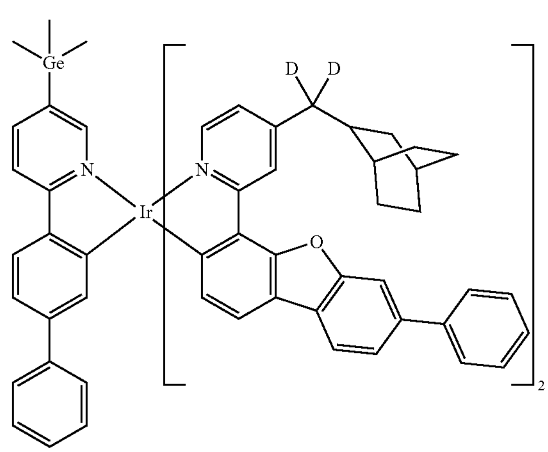

-continued
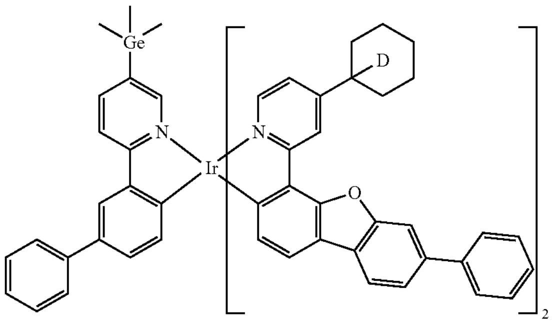
3835
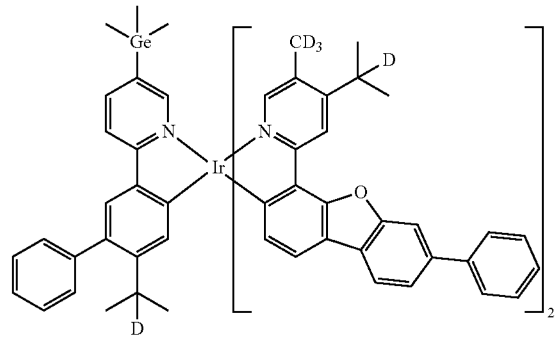
3836
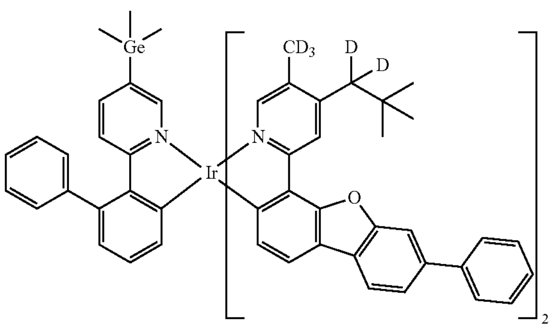
3837
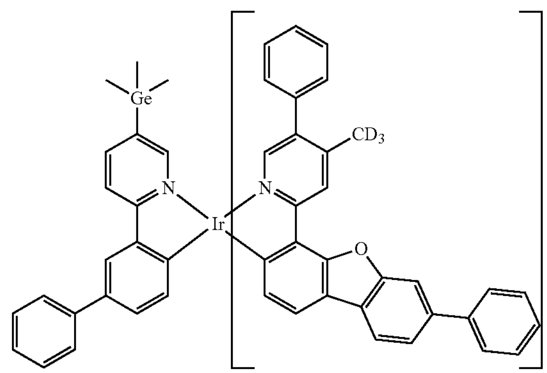
3838
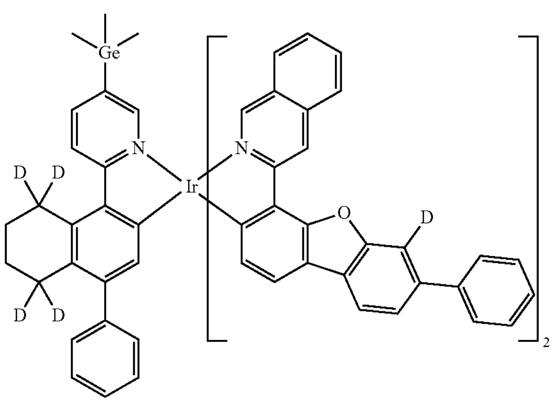
3839
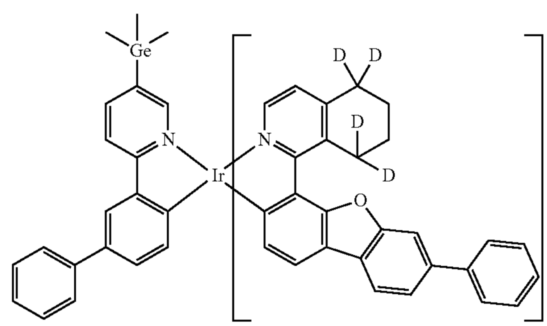
3840
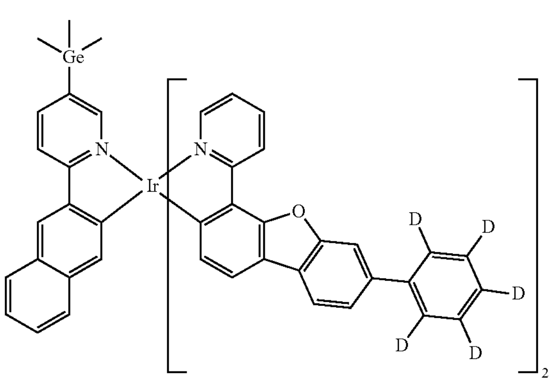
3841
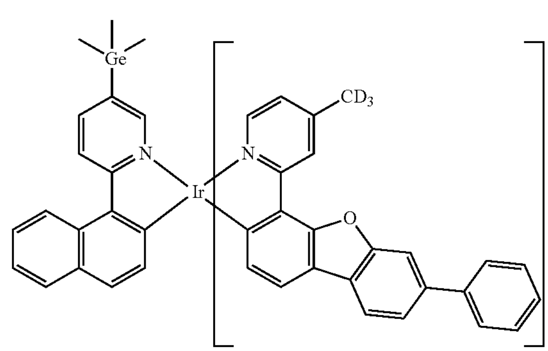
3842

-continued
3843
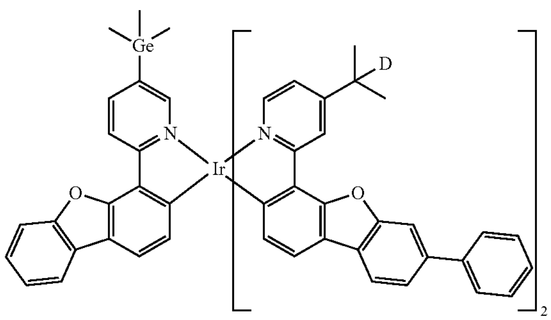
3844
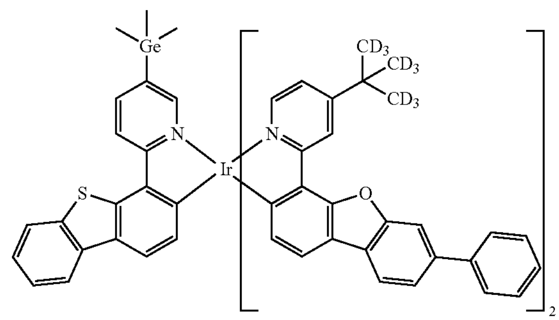
3845
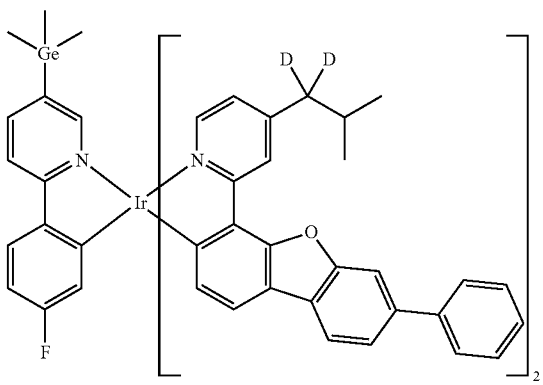
3846
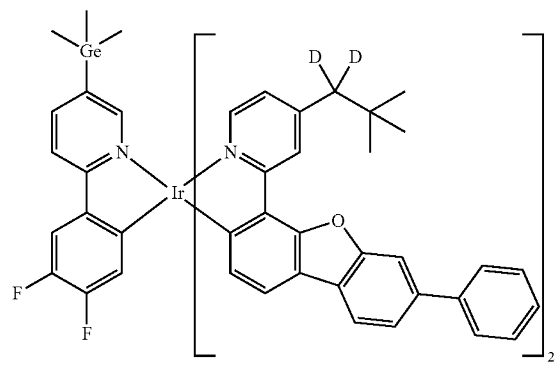
3847
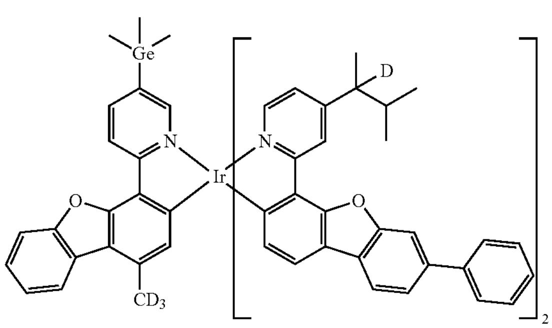
3848
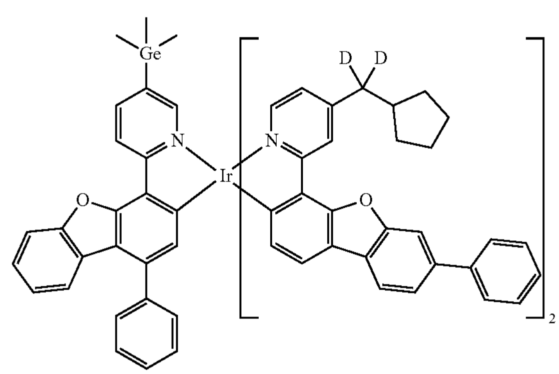
3849
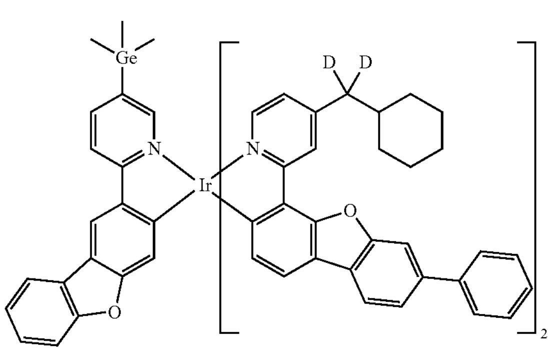
3850
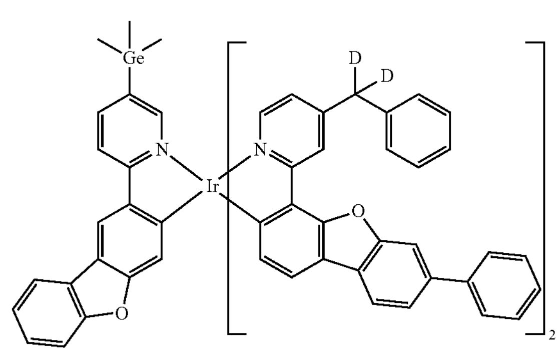

-continued
3851
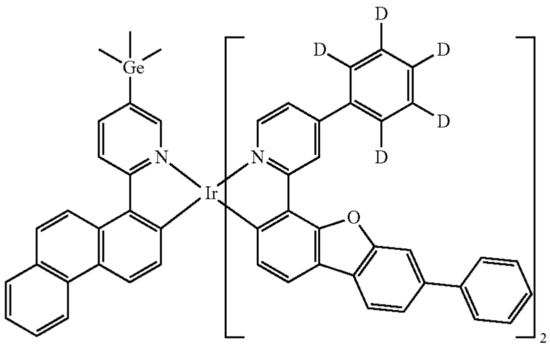
3852
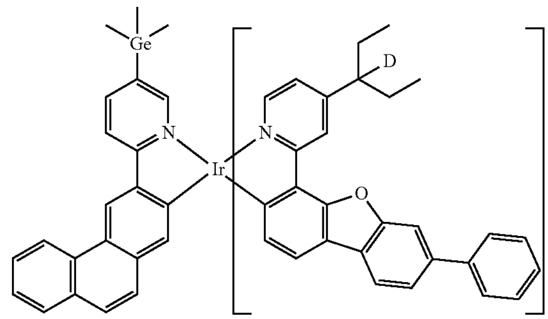
3853
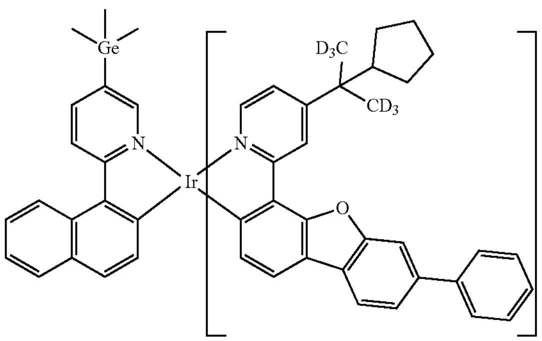
3854
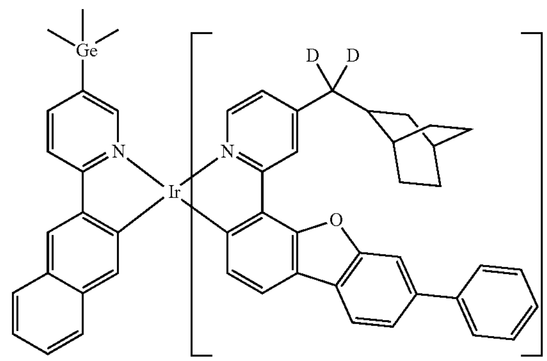
3855
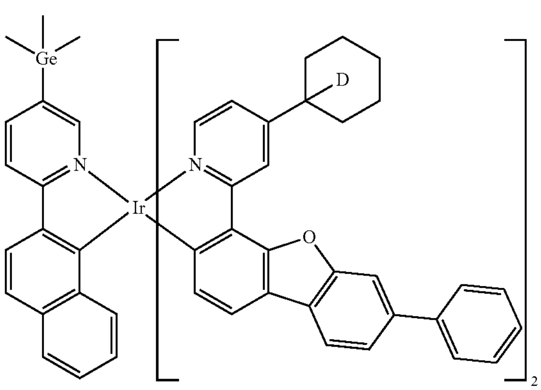
3856
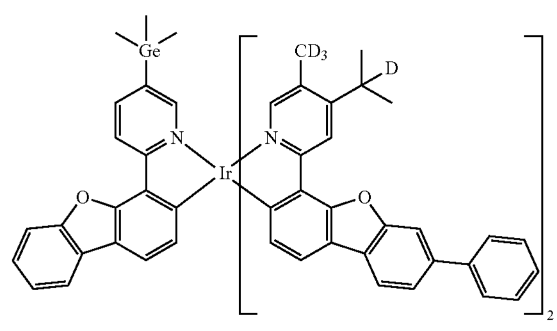
3857
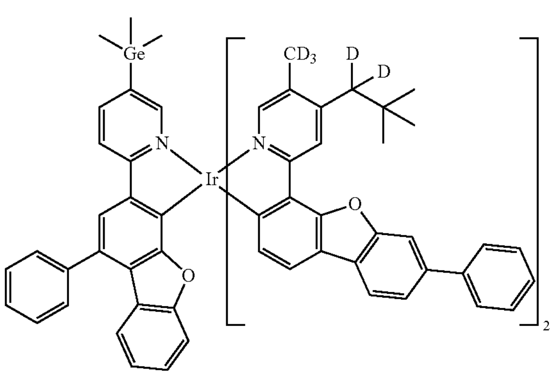
3858
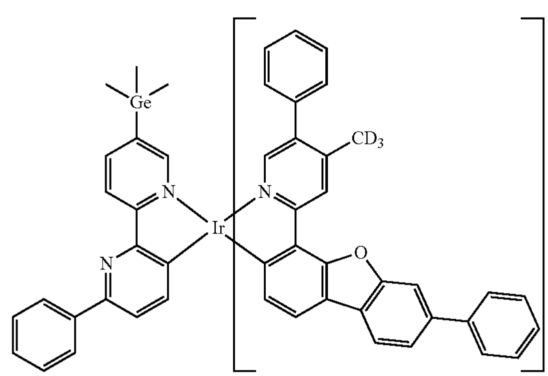

-continued
3859
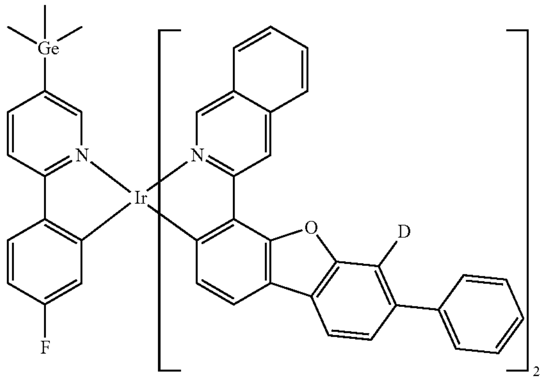
3860
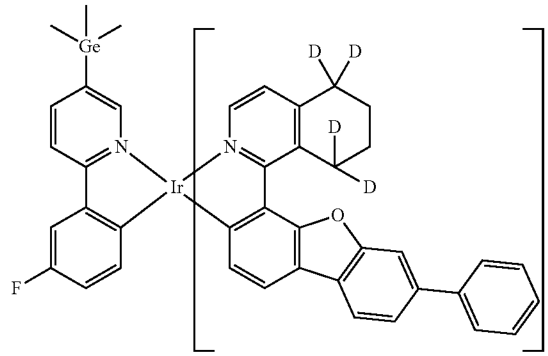
3861
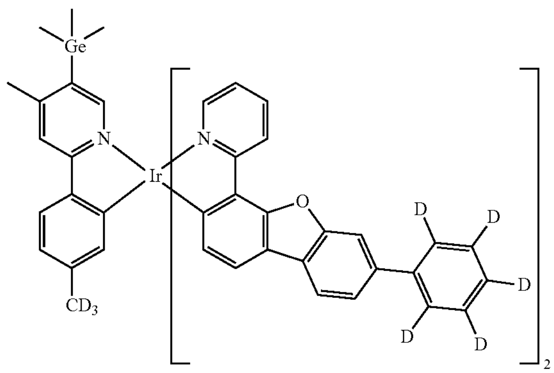
3862
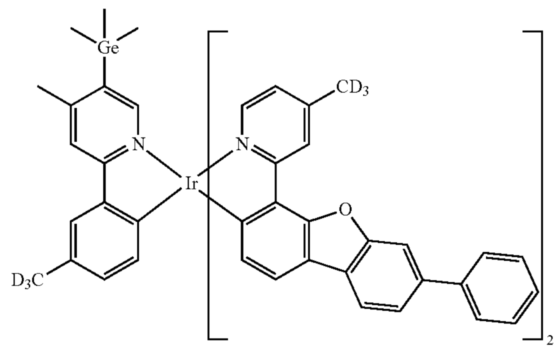
3863
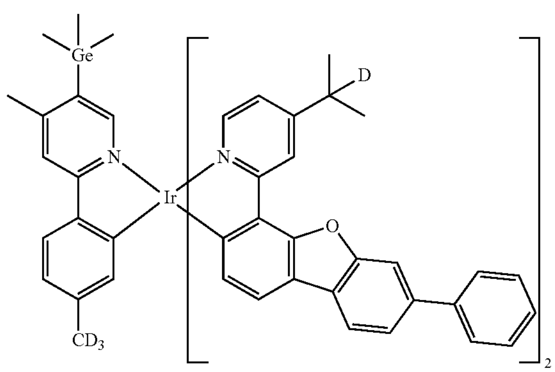
3864
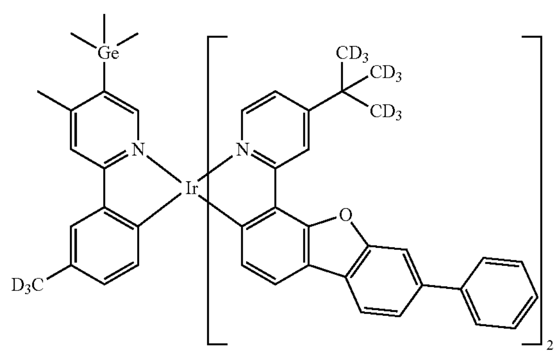
3865
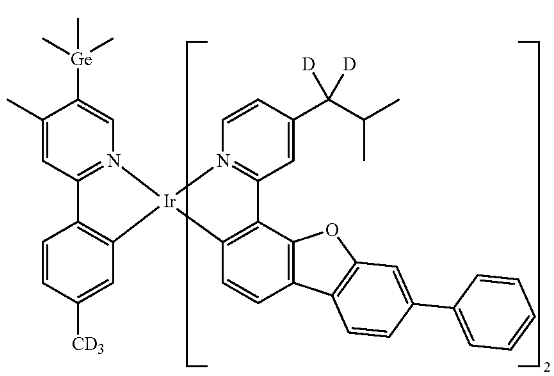
3866
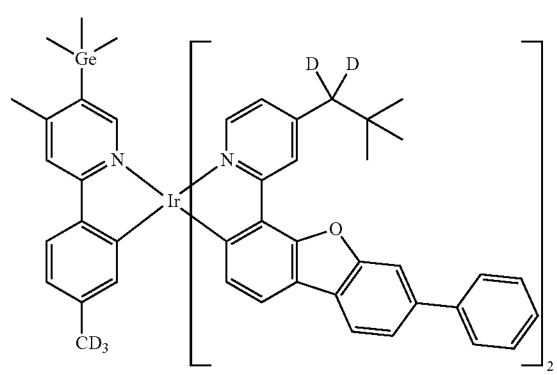

-continued
3867
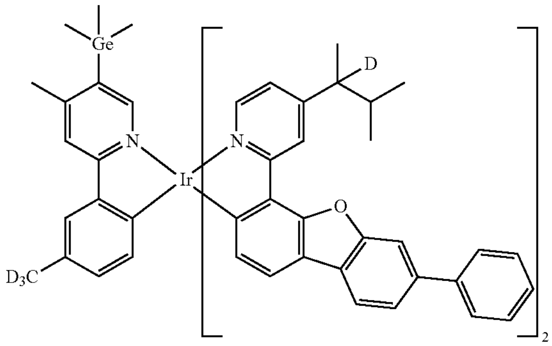
3868
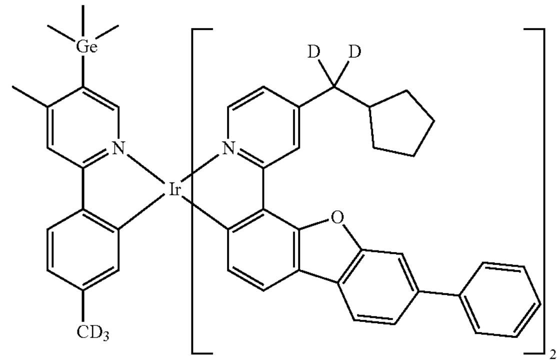
3869
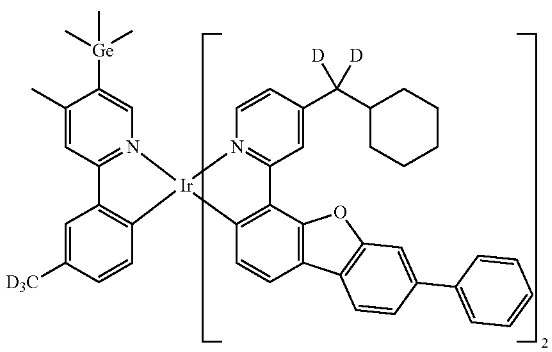
3870
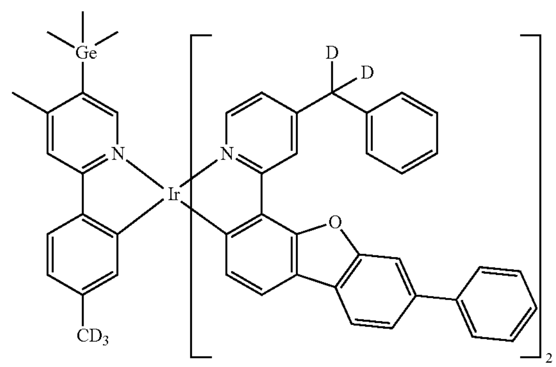
3871
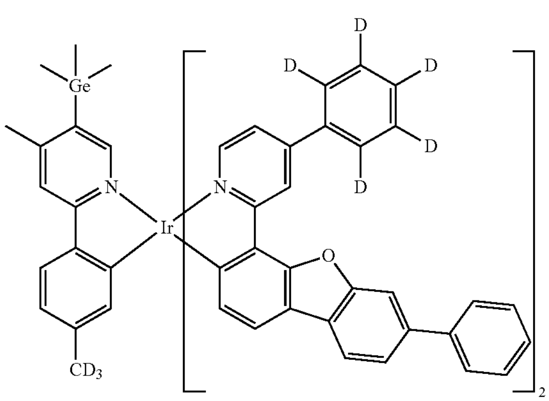
3872
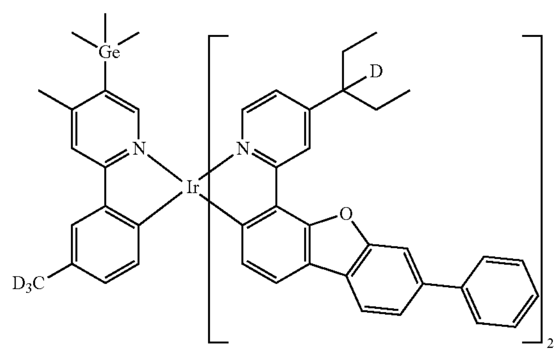
3873
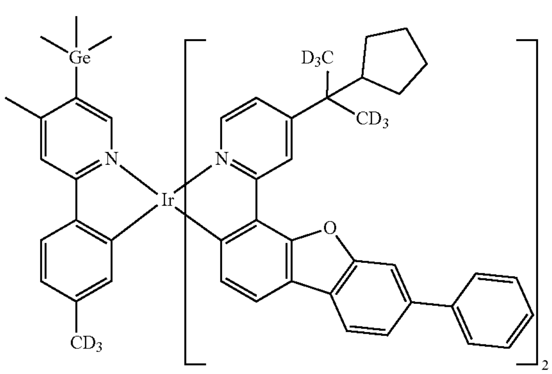
3874
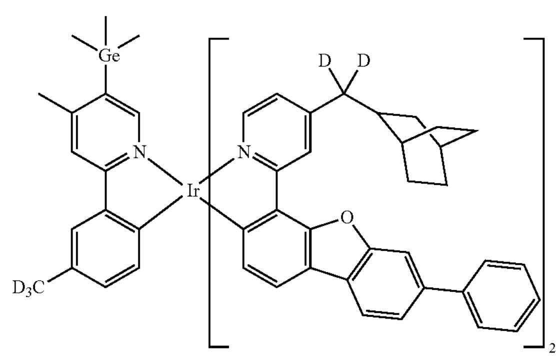

-continued
3875
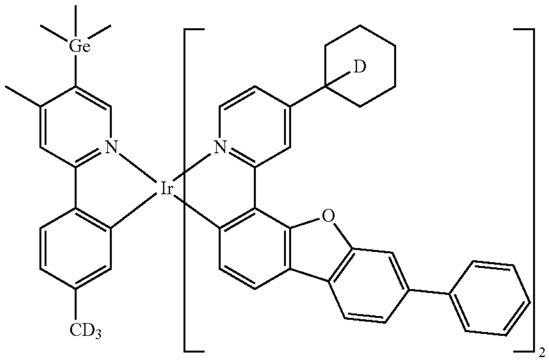
3876
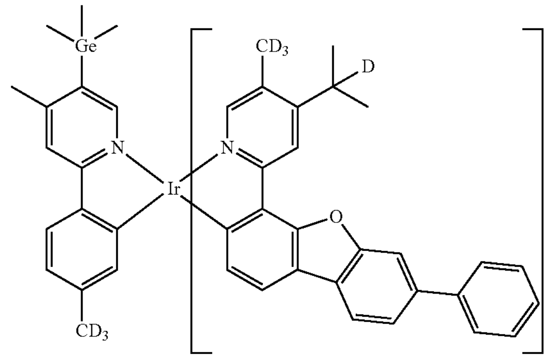
3877
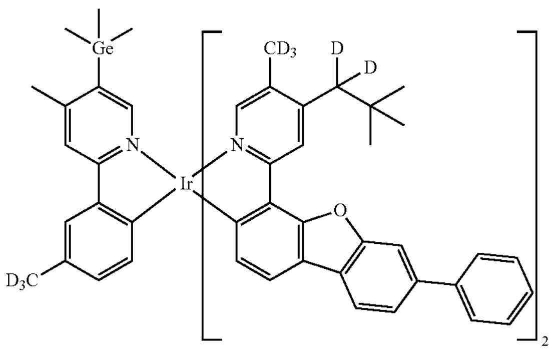
3878
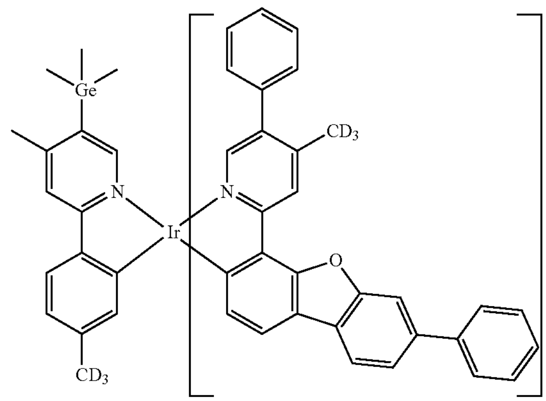
3879
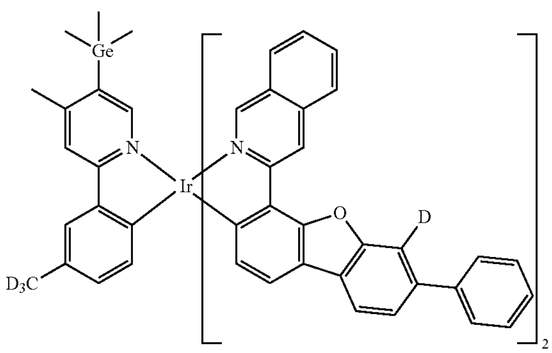
3880
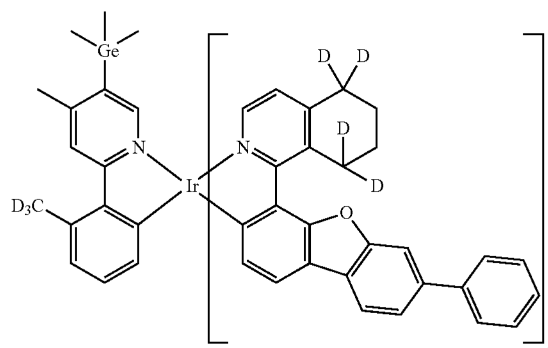
3881
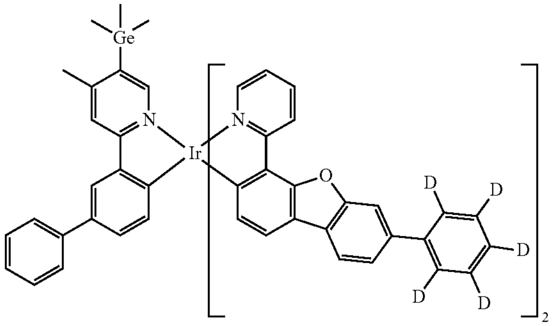
3882
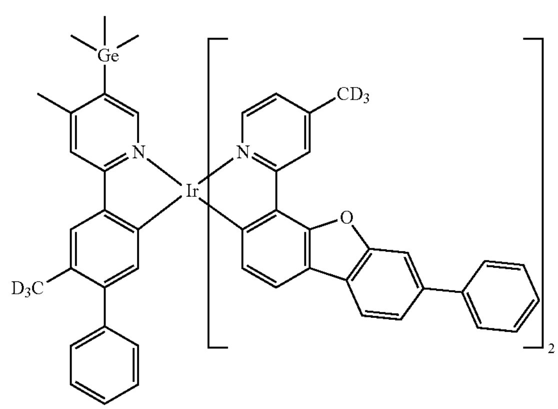

-continued
3883
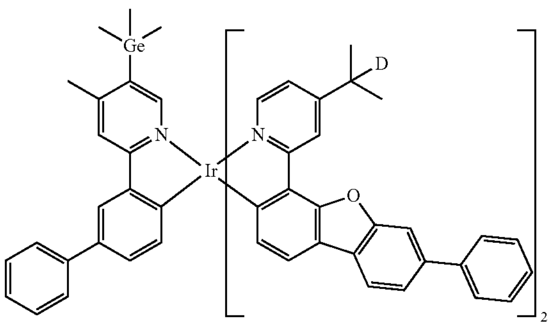
3884
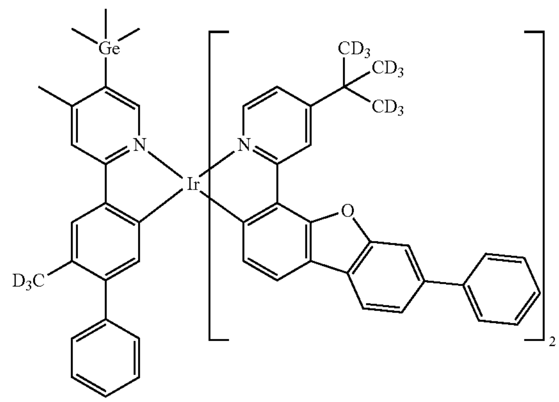
3885
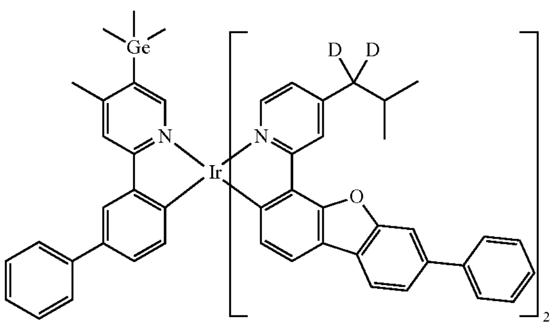
3886
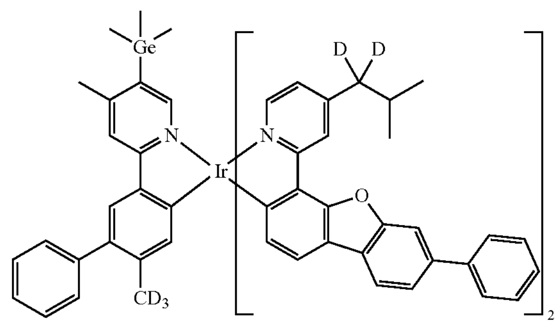
3887
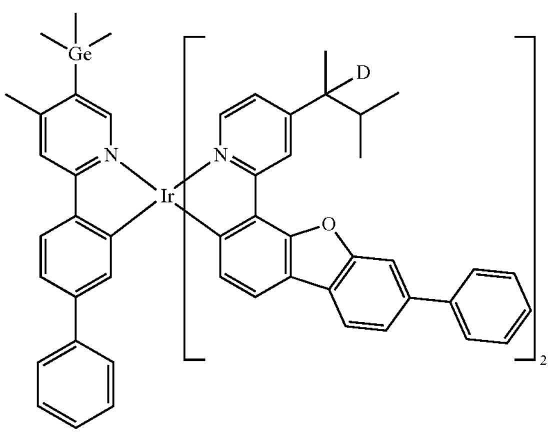
3888
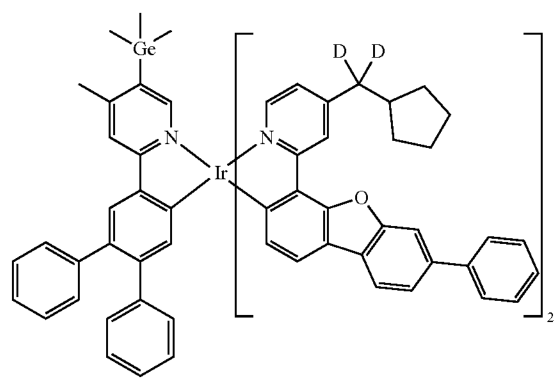
3889
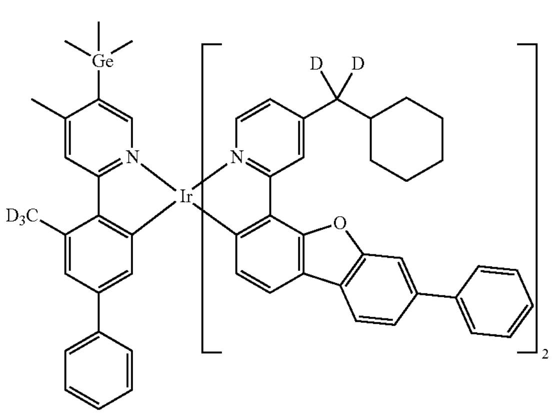
3890
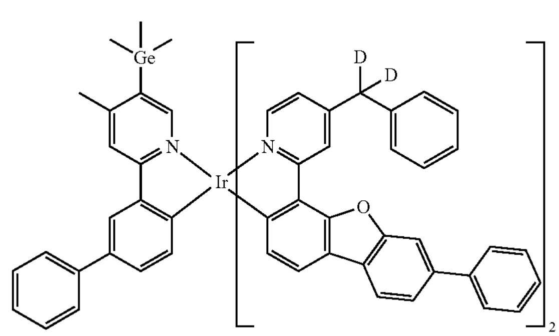

-continued
3891
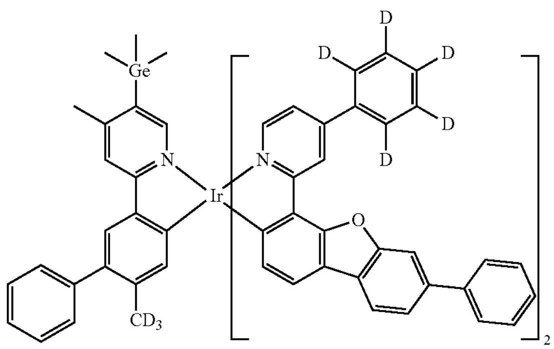
3892
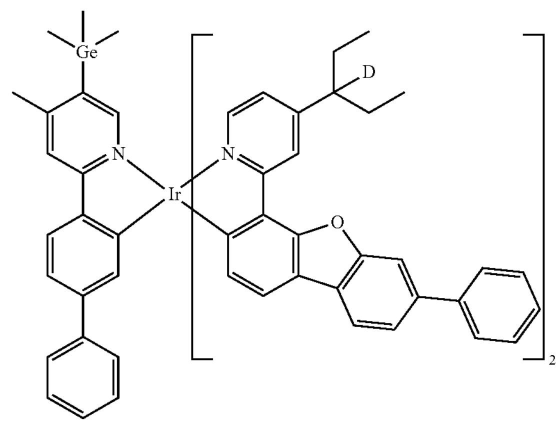
3893
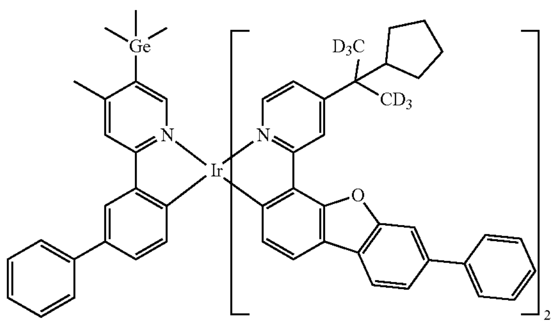
3894
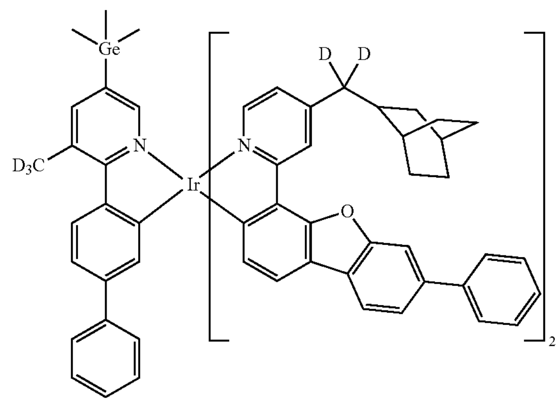
3895
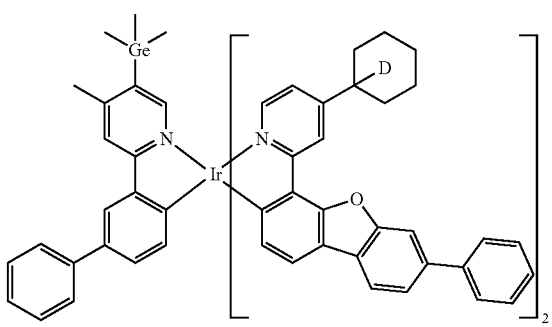
3896
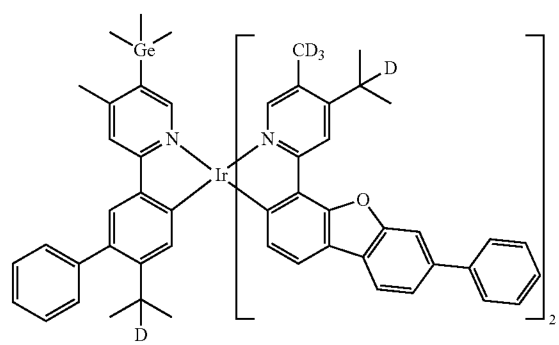
3897
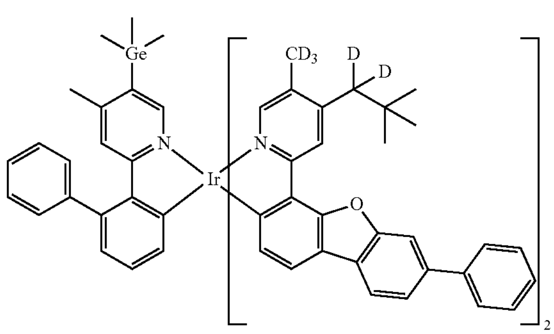
3898
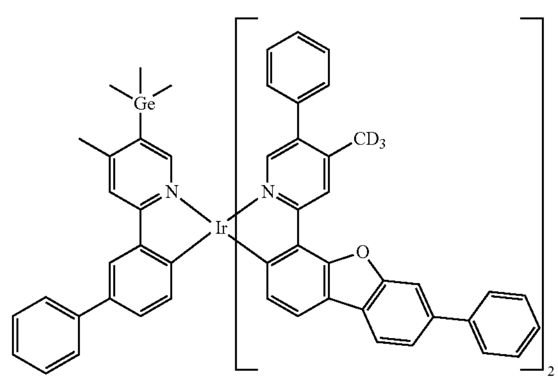

-continued
3899
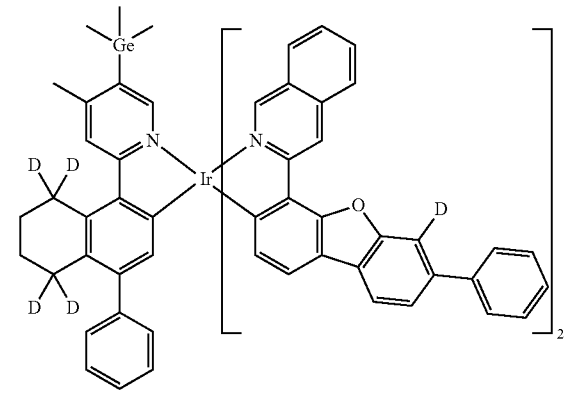
3900
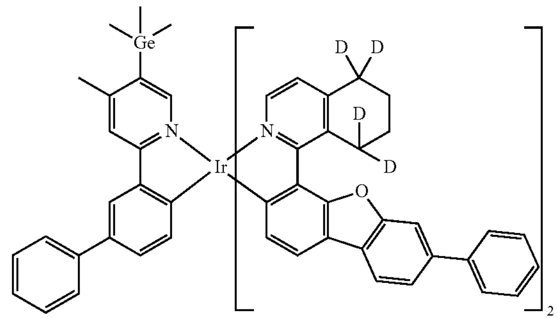
3901
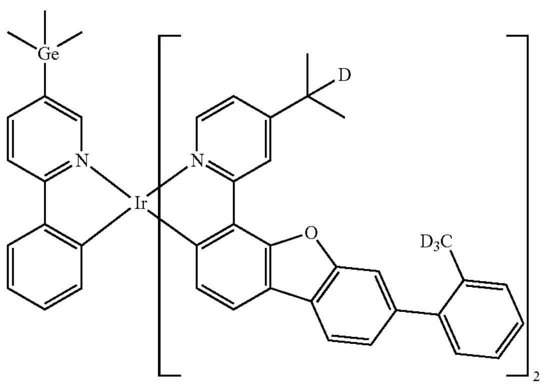
3902
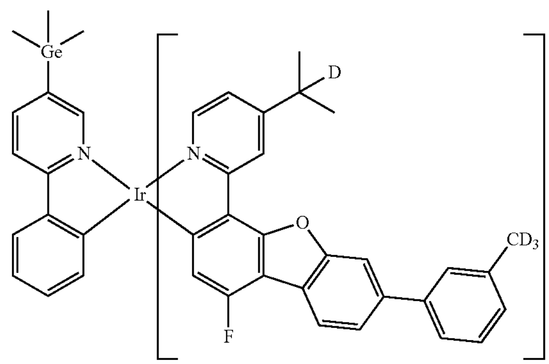
3903
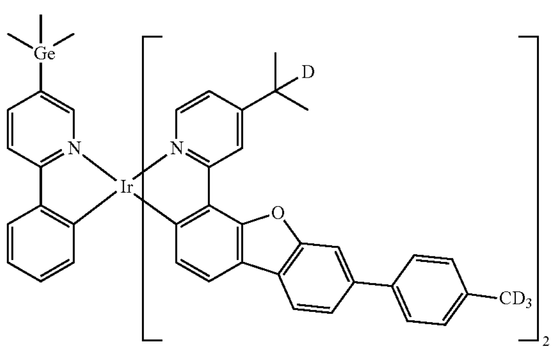
3904
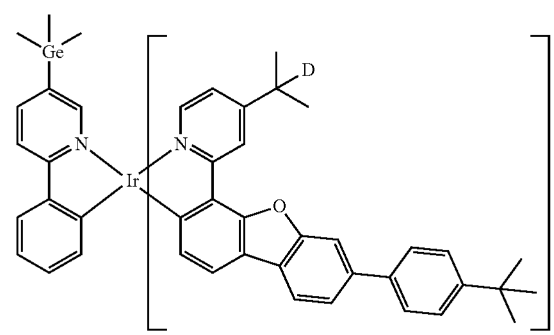
3905
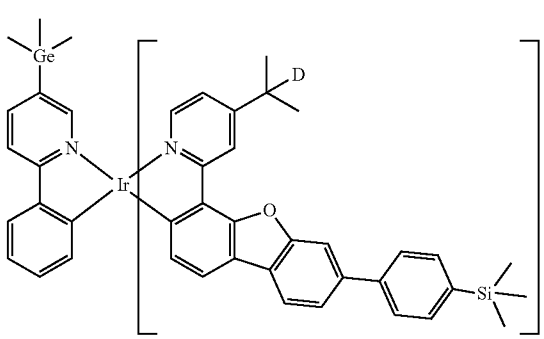
3906
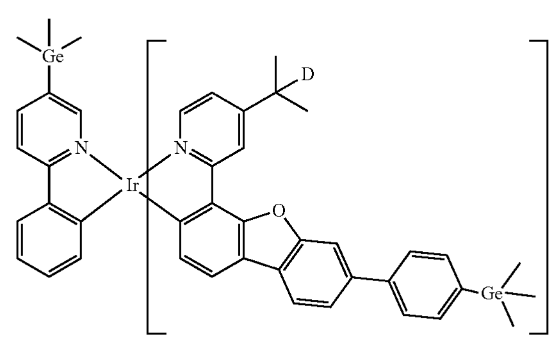

-continued
3907
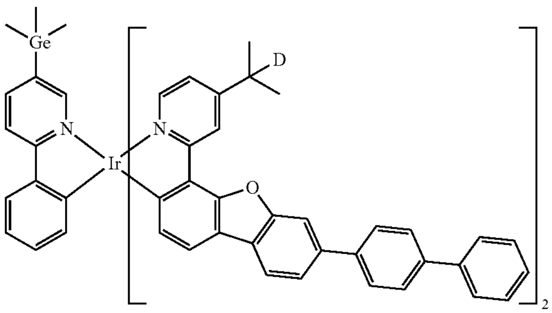
3908
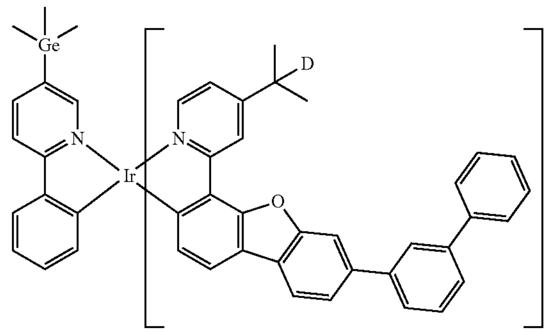
3909
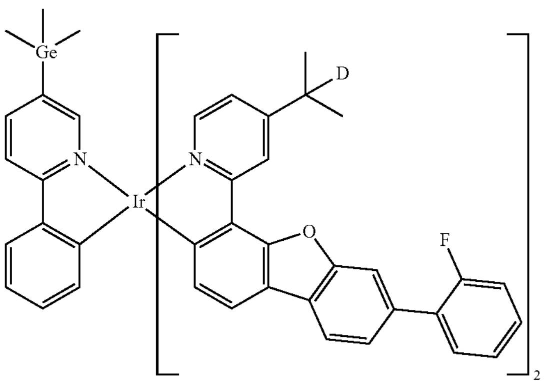
3910
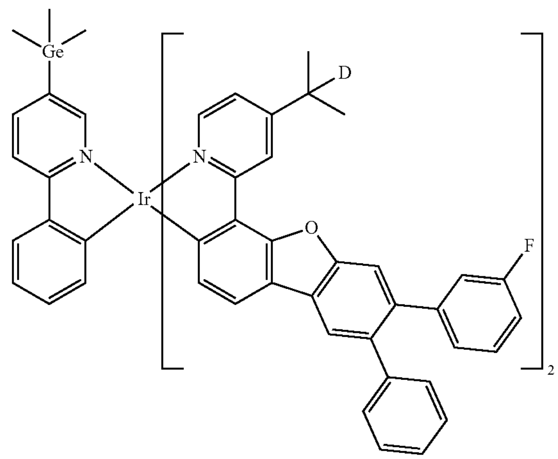
3911
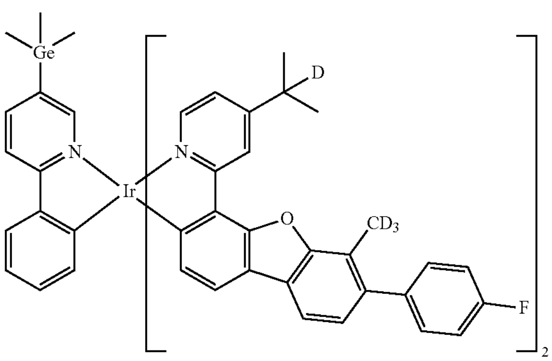
3912
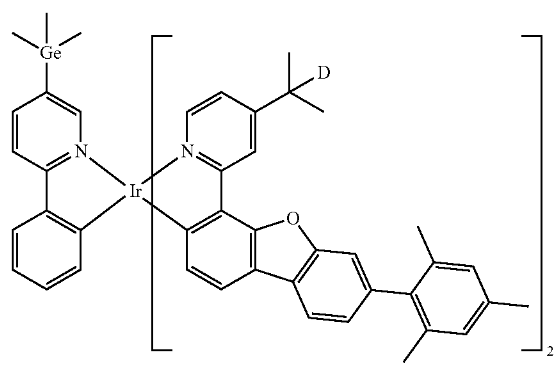
3913
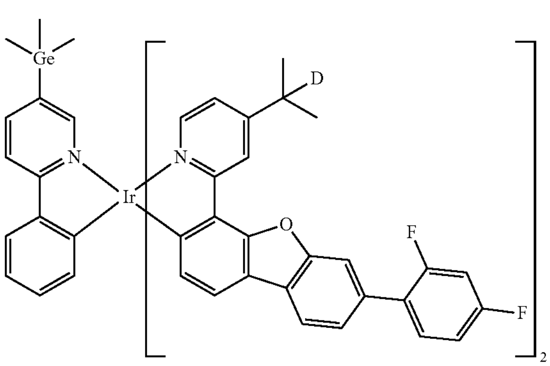
3914
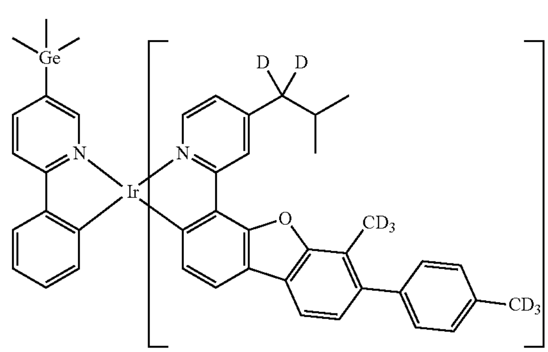

-continued
3915
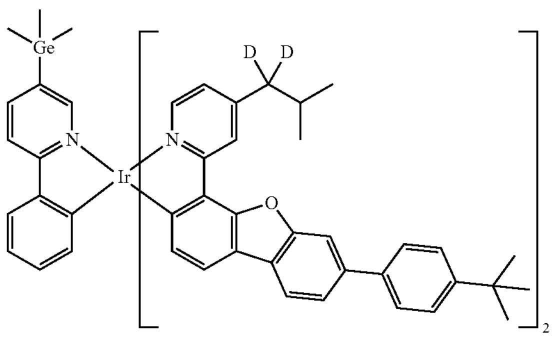
3916
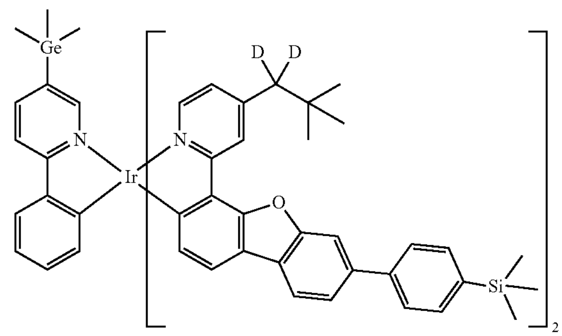
3917
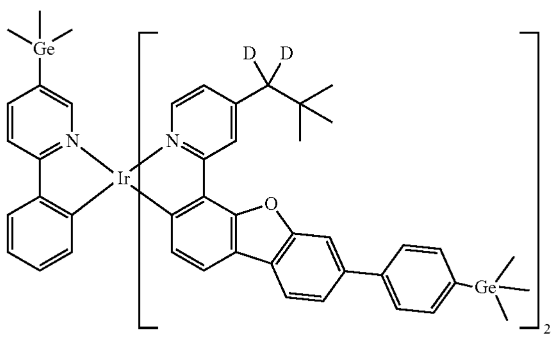
3918
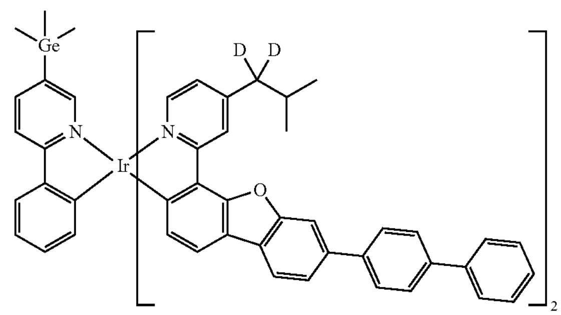
3919
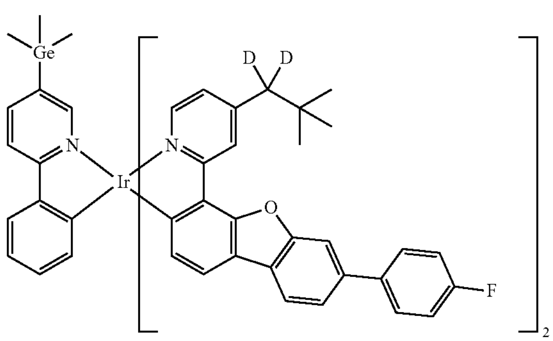
3920
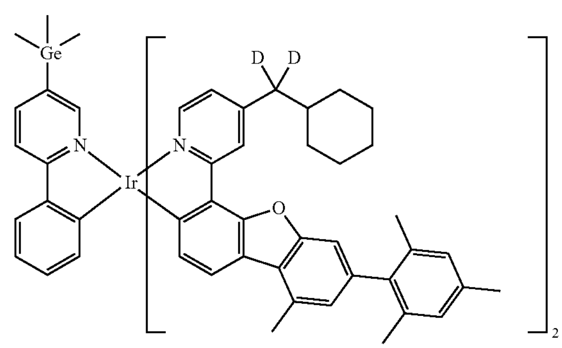
3921
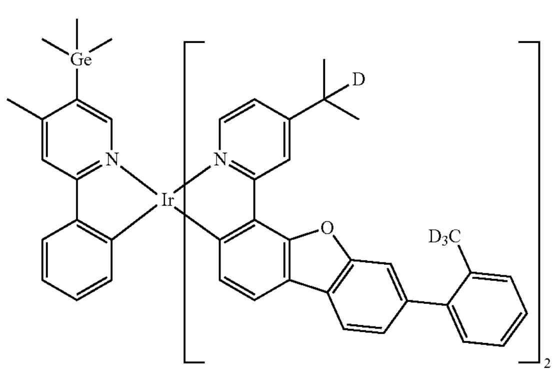
3922
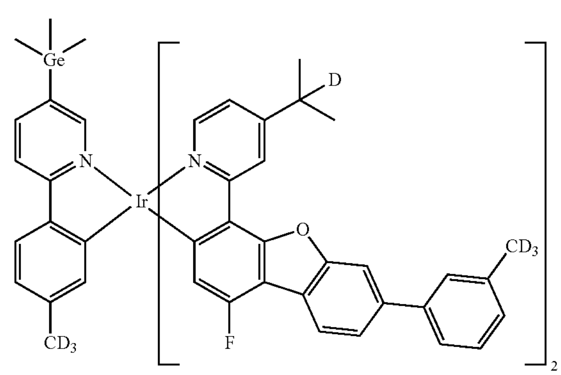

-continued
3923
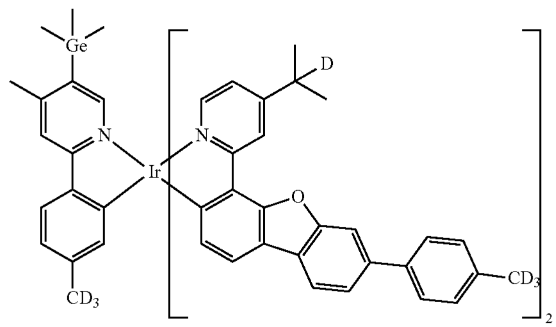
3924
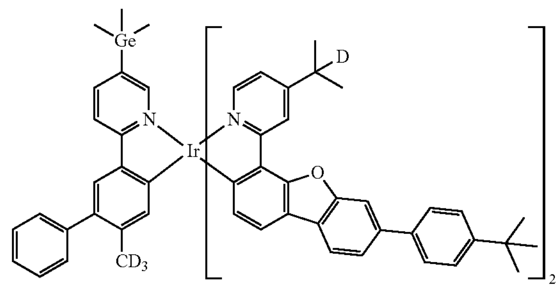
3925
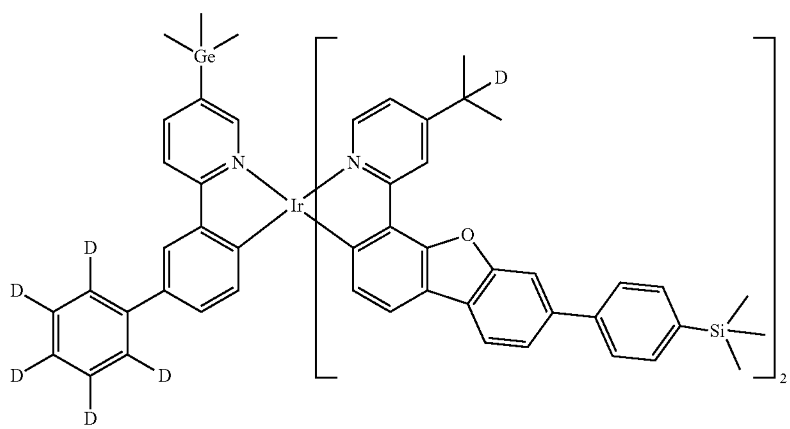
3926
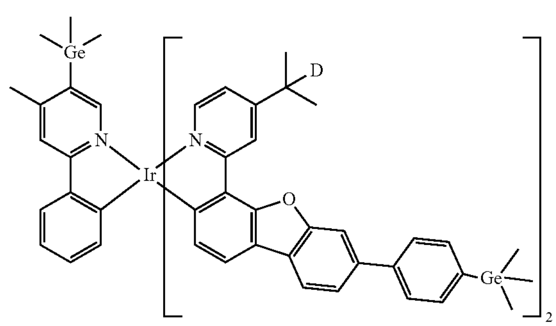
3927
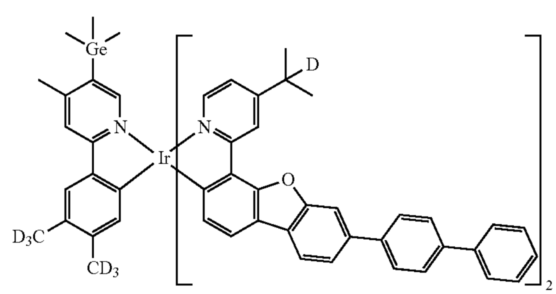
3928
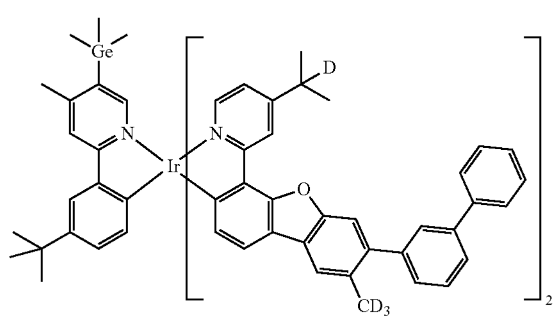
3929
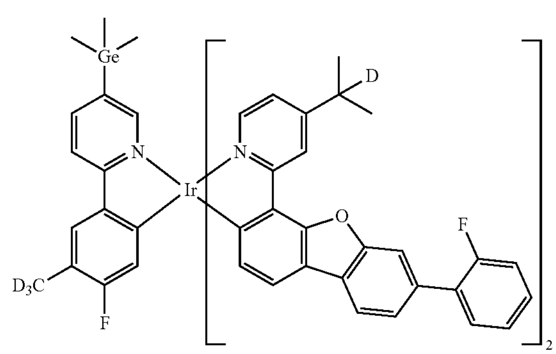

-continued
3930
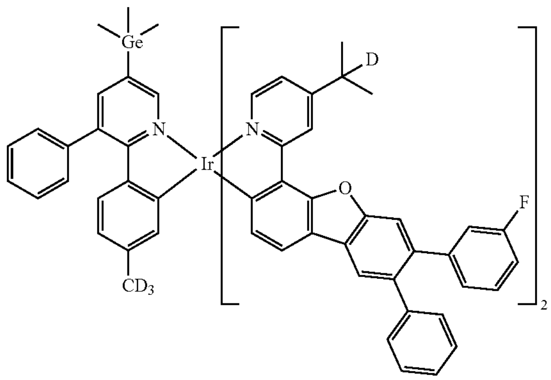
3931
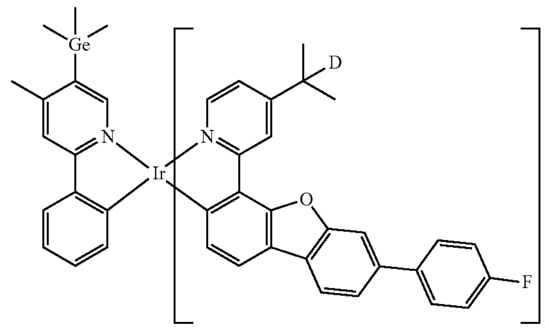
3932
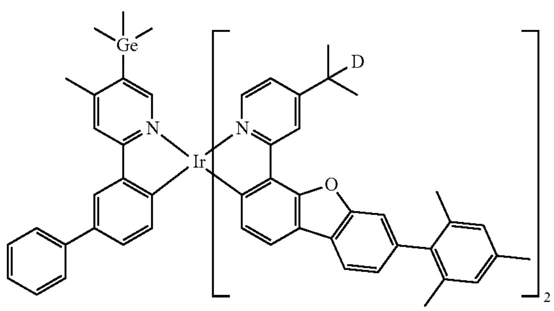
3933
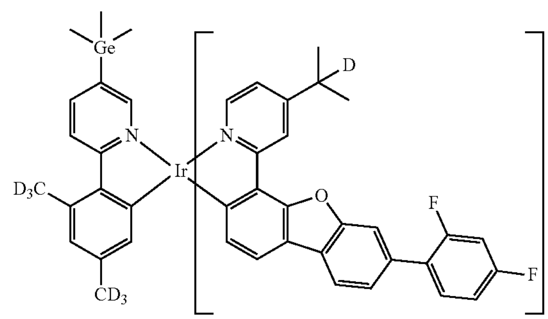
3934
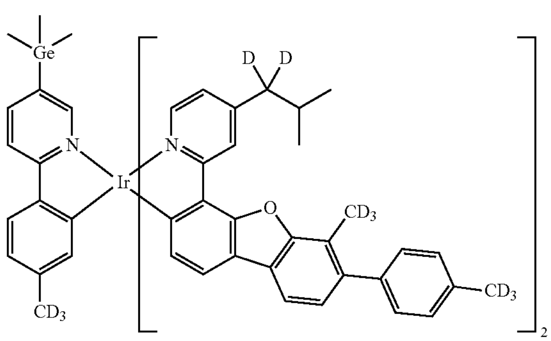
3935
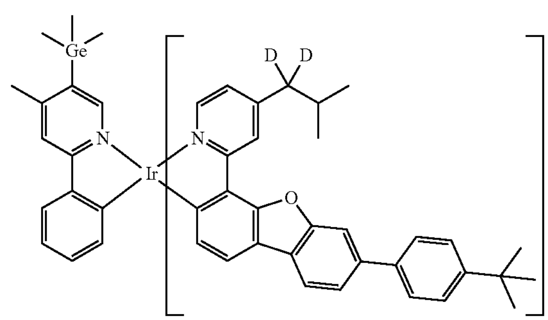
3936
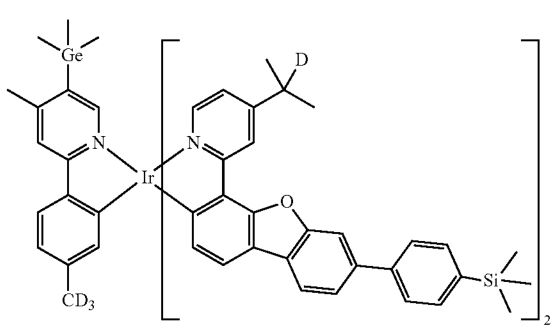
3937
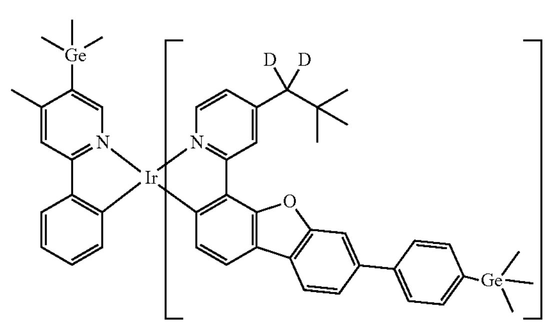

-continued
3938
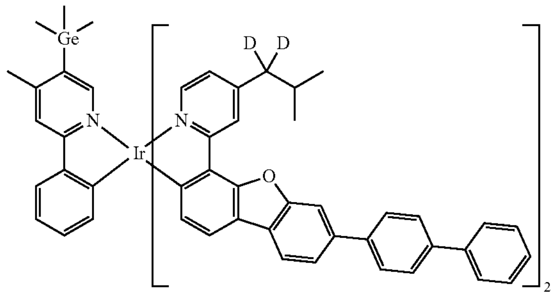
3939
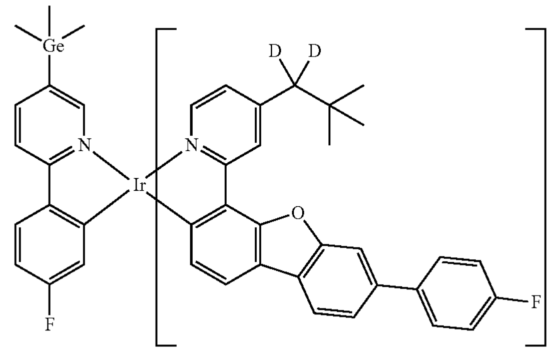
3940
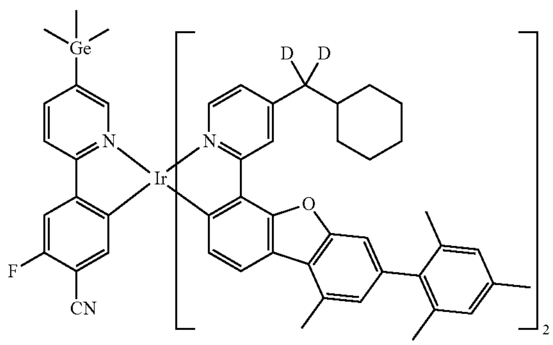
3941
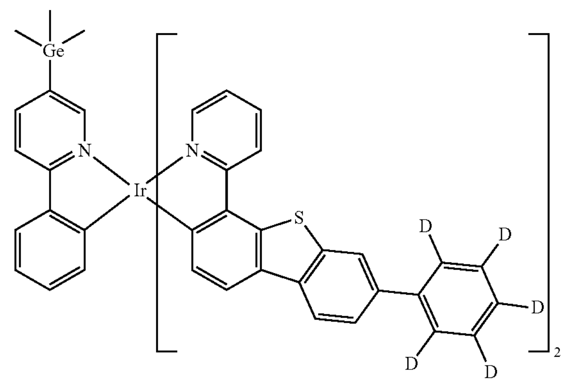
3942
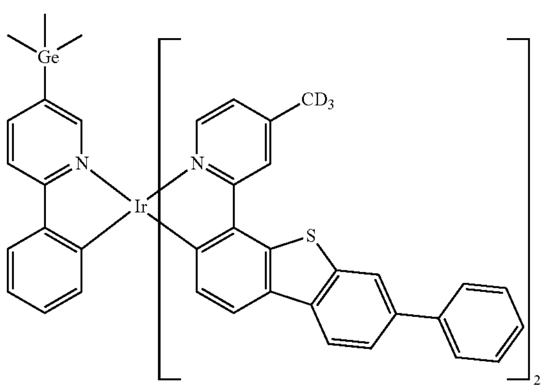
3943
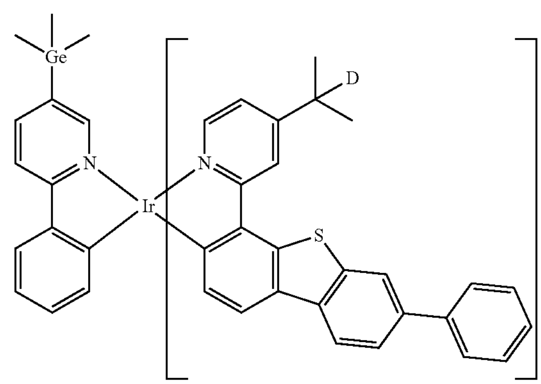
3944
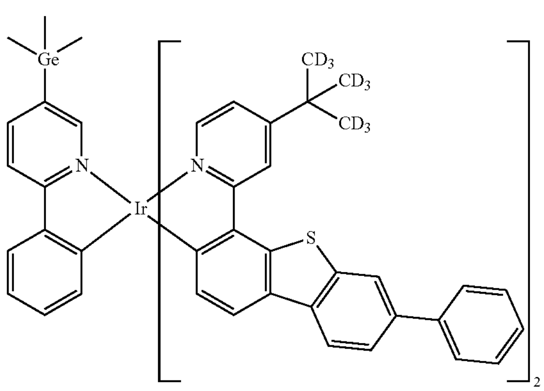
3945
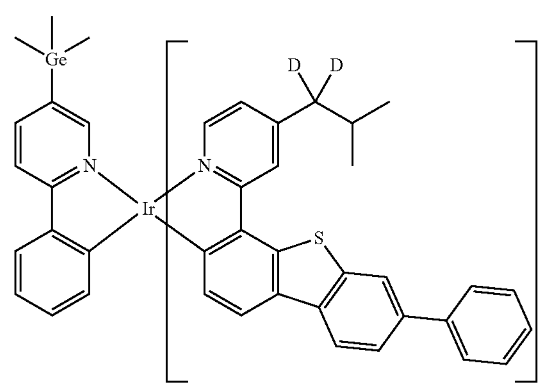

-continued
3946
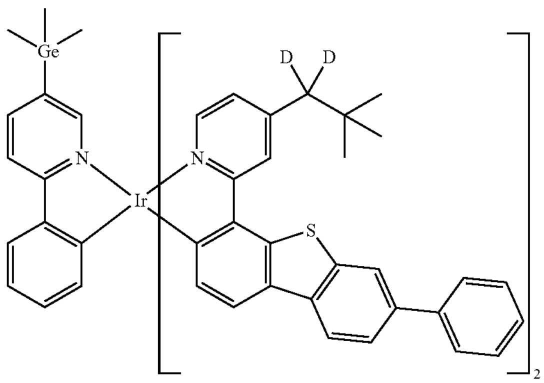
3947
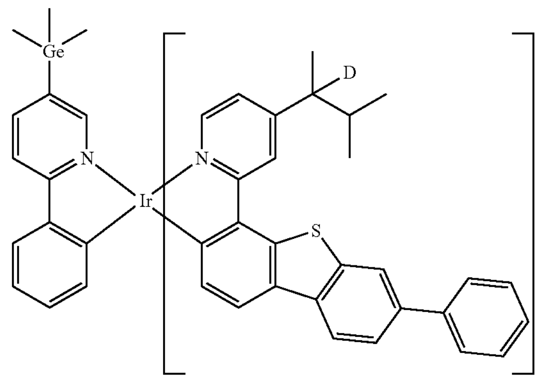
3948
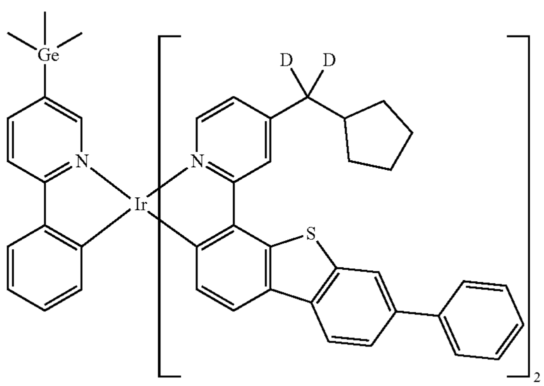
3949
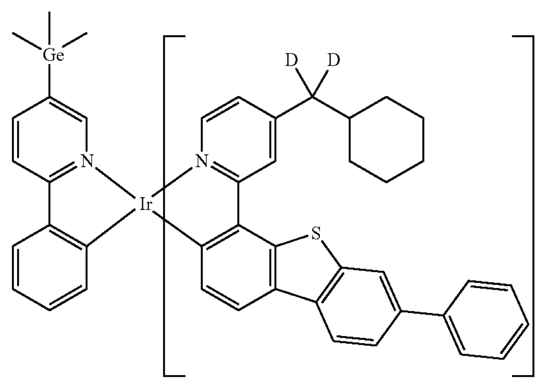
3950
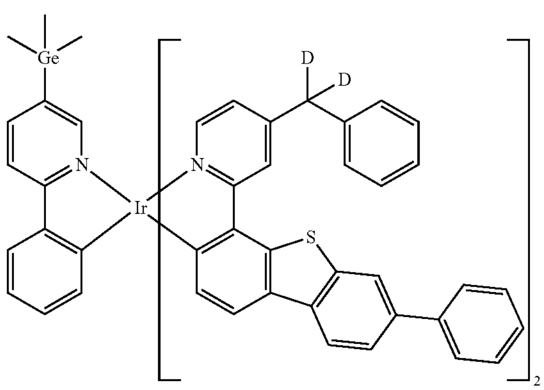
3951
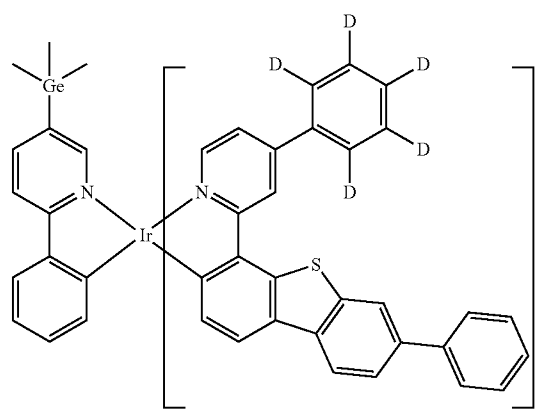
3952
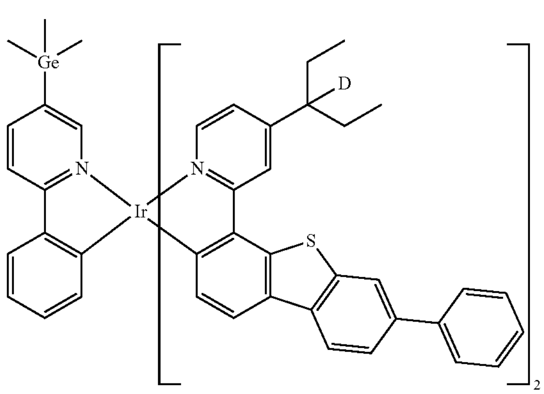
3953
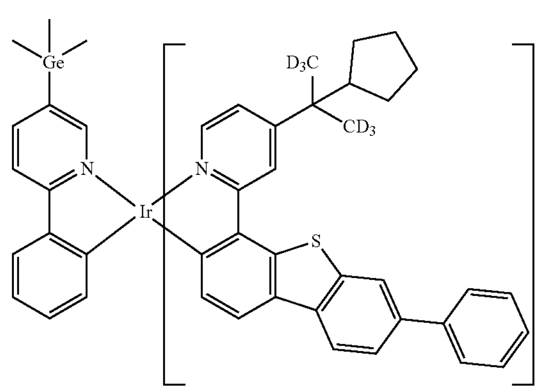

-continued
3954
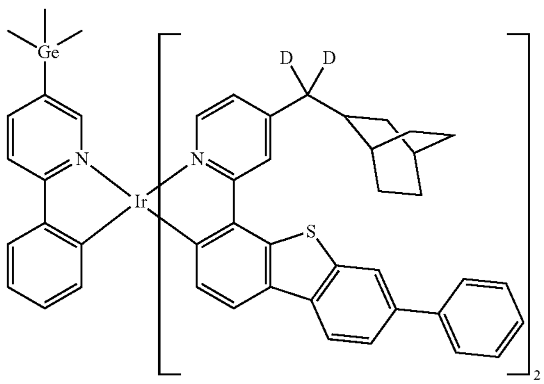
3955
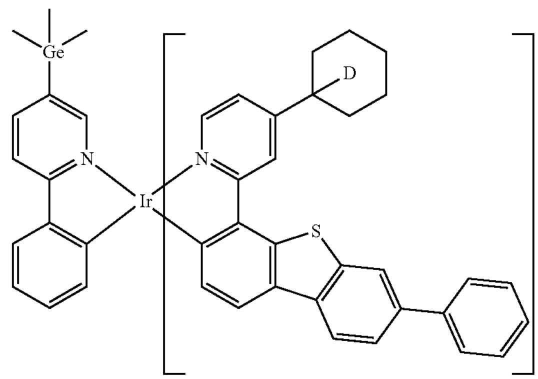
3956
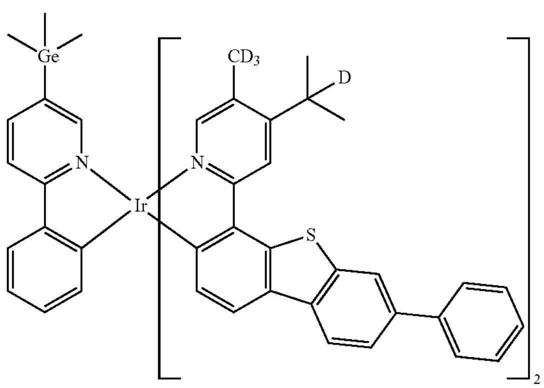
3957
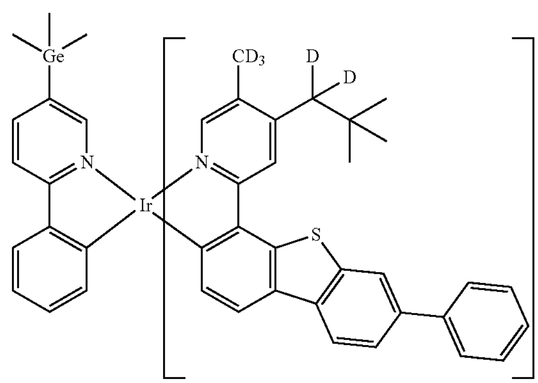
3958
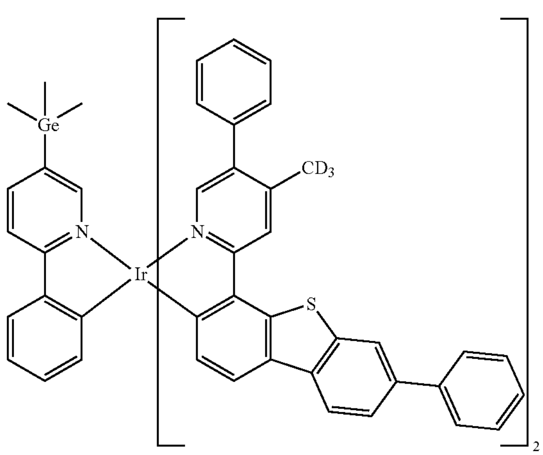
3959
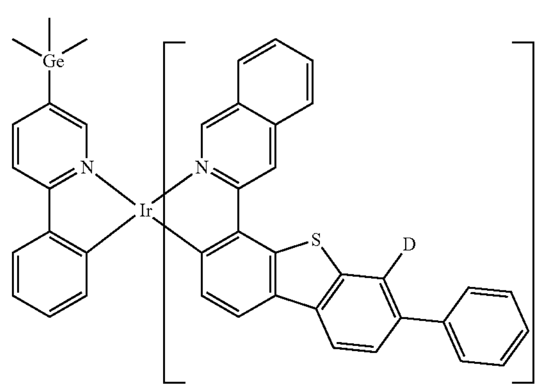

-continued
3960
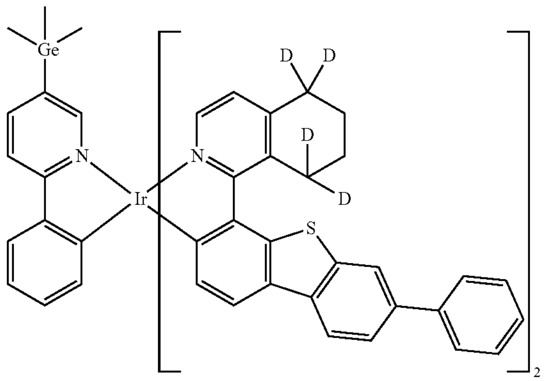
3961
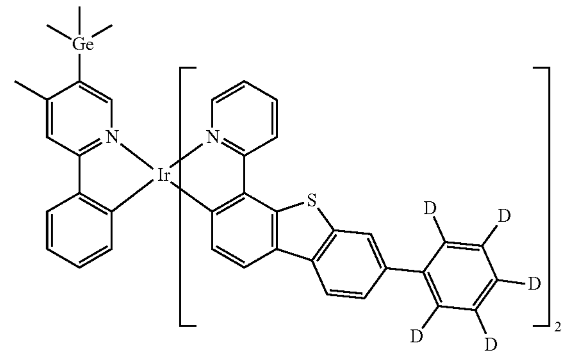
3962
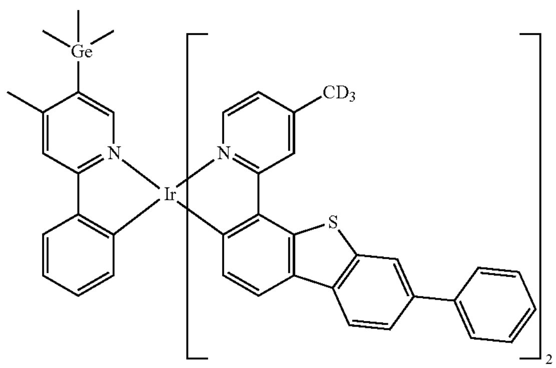
3963
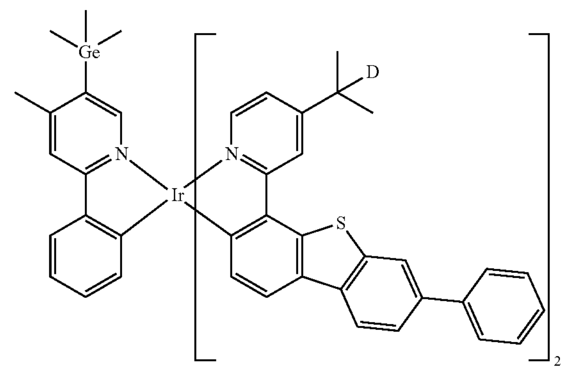
3964
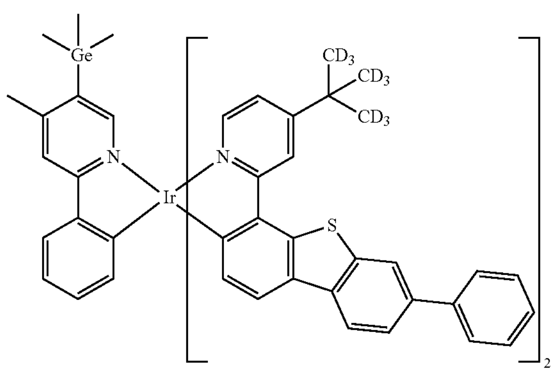
3965
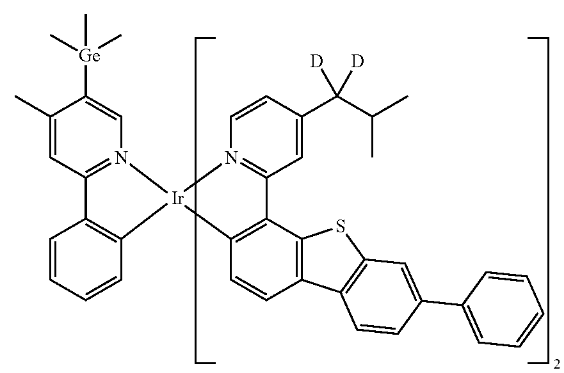
3966
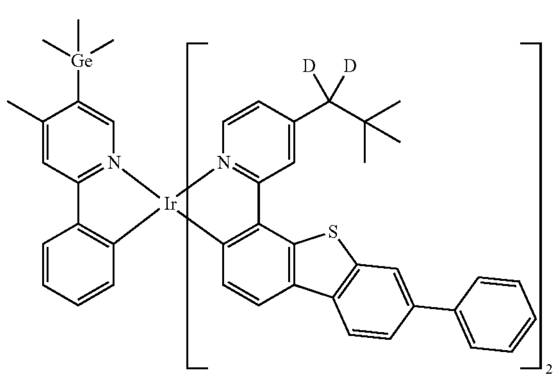
3967
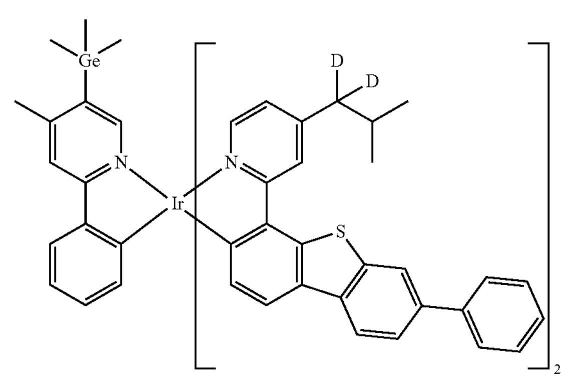

-continued
3968
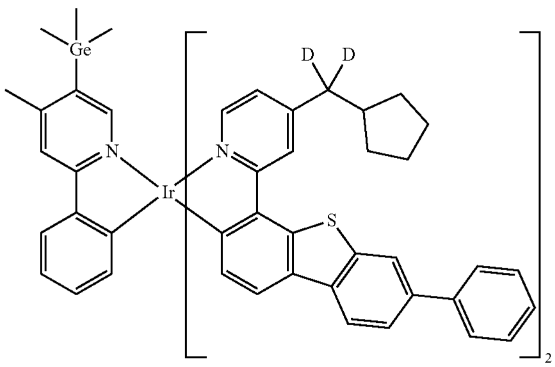
3969
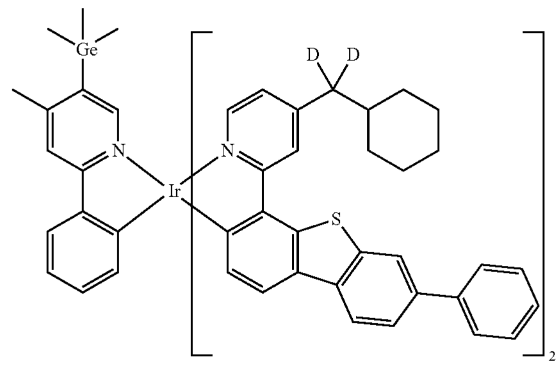
3970
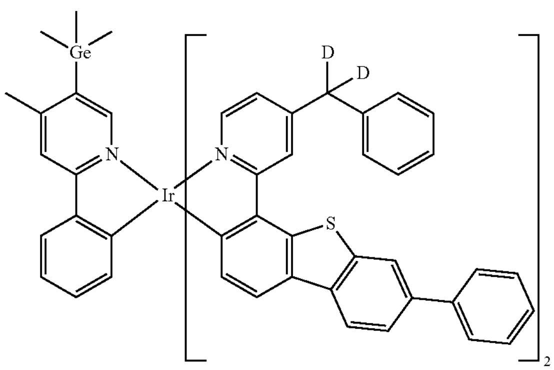
3971
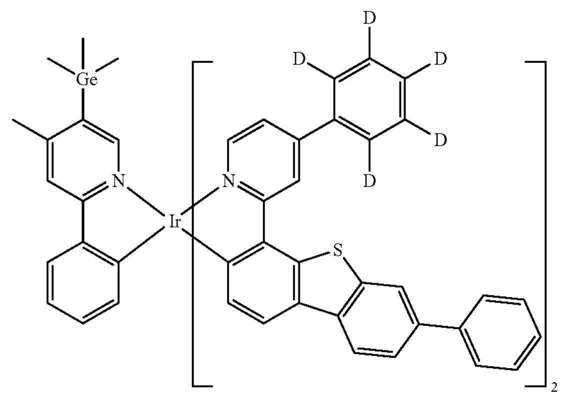
3972
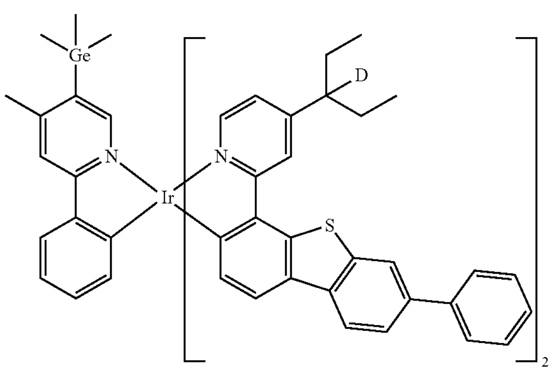
3973
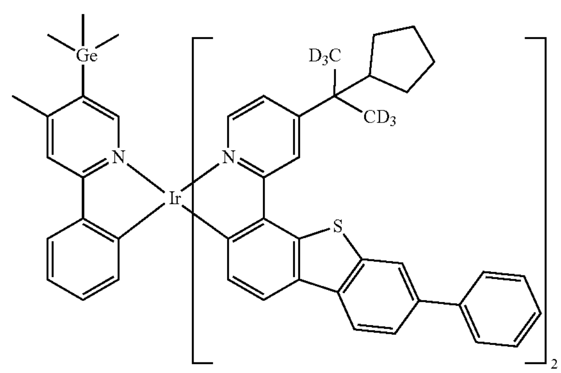
3974
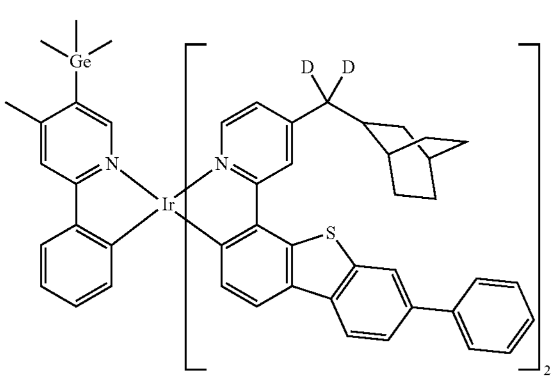
3975
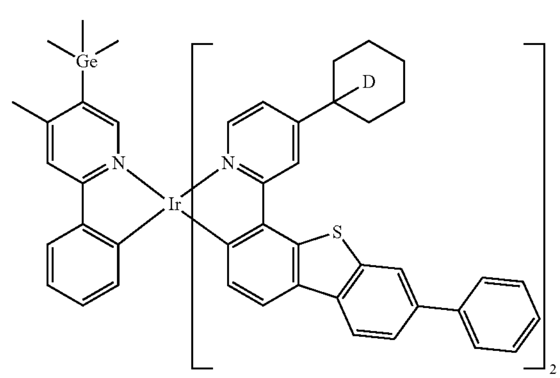

-continued
3976
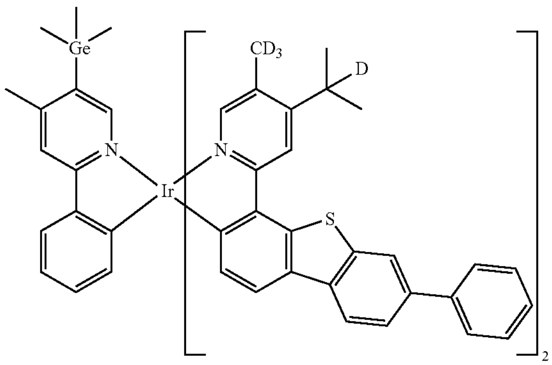
3977
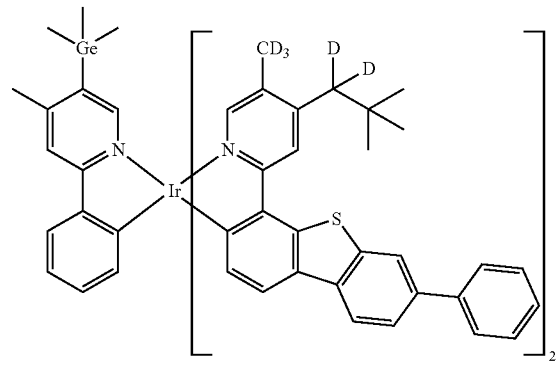
3978
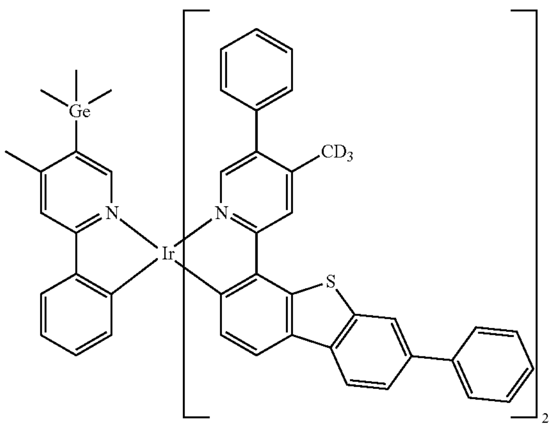
3979
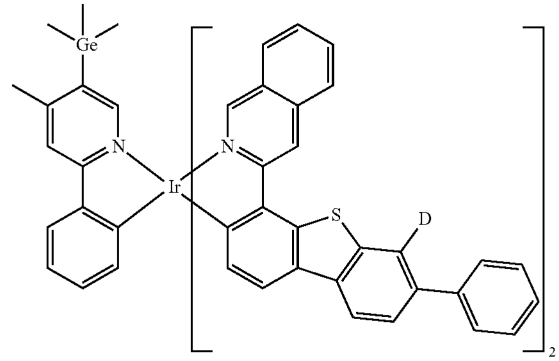
3980
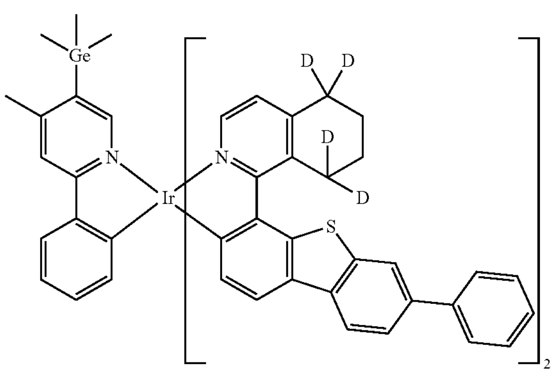
3981
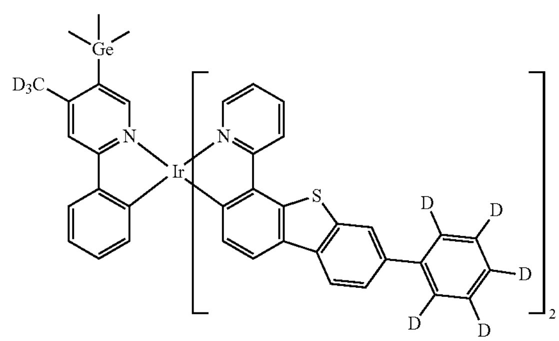
3982
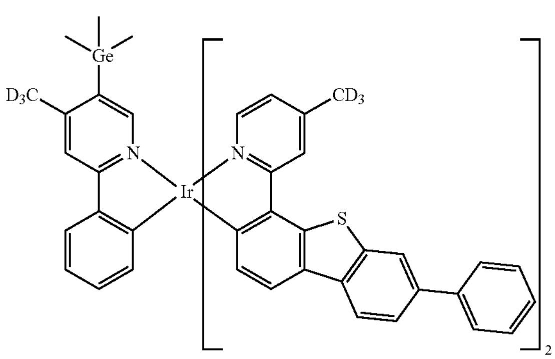
9383
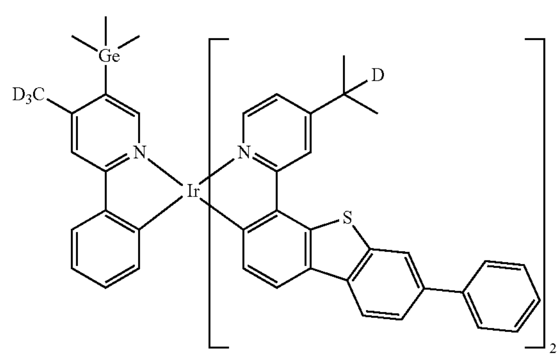

-continued
3984
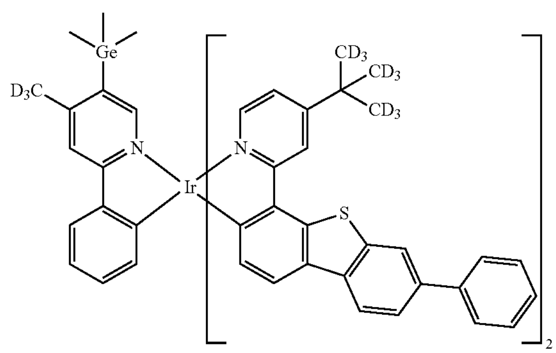
3985
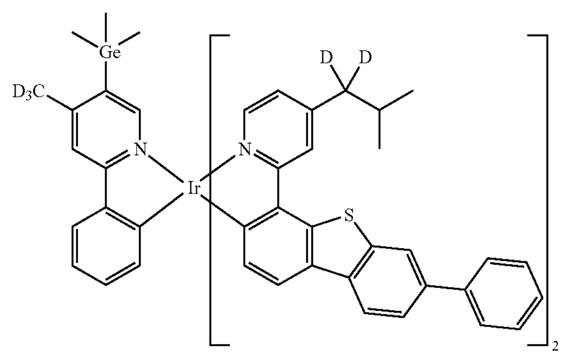
3986
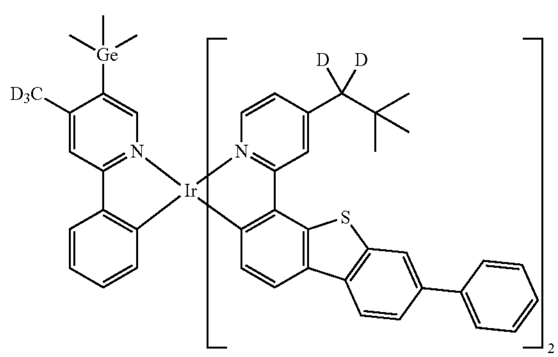
3987
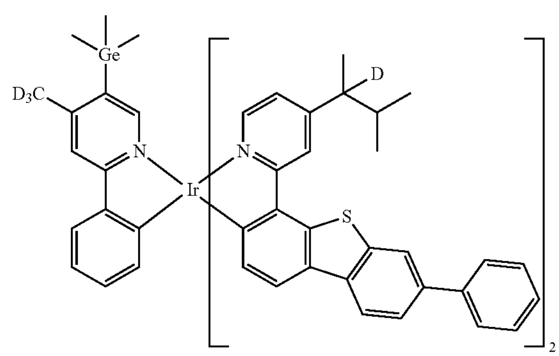
3988
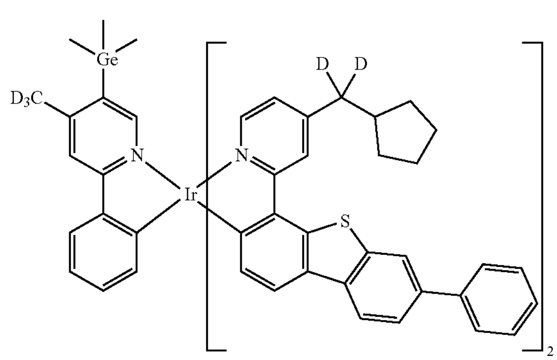
3989
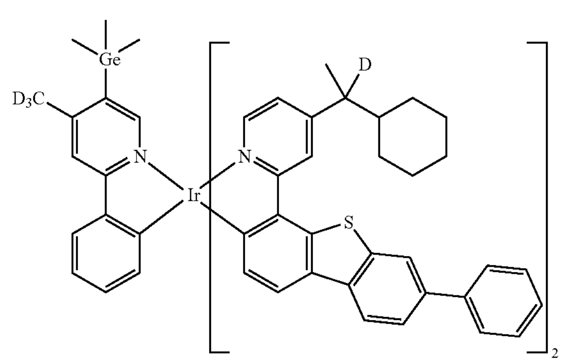
3990
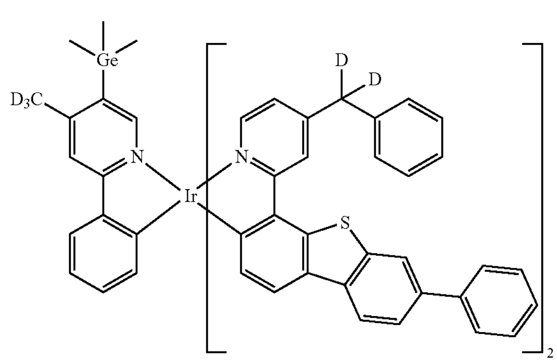
3991
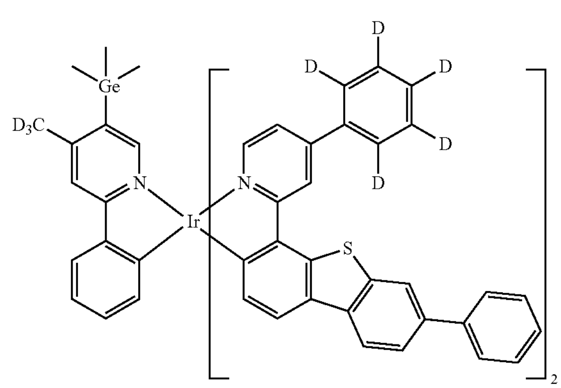

-continued
3992
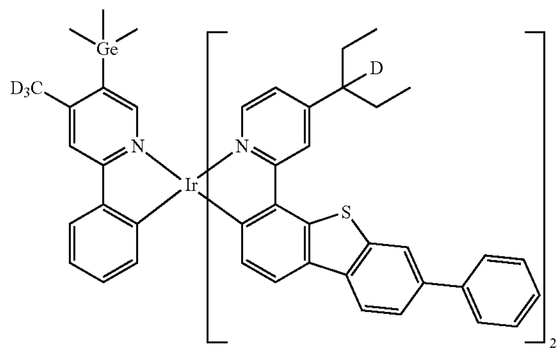
3993
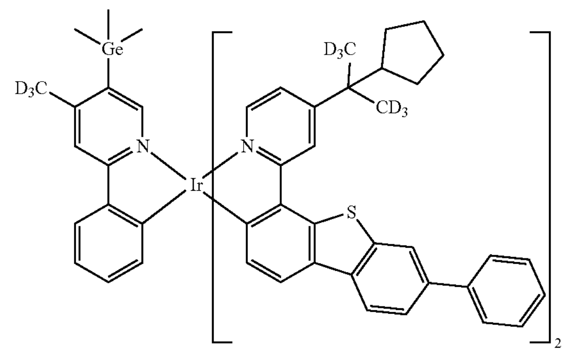
3994
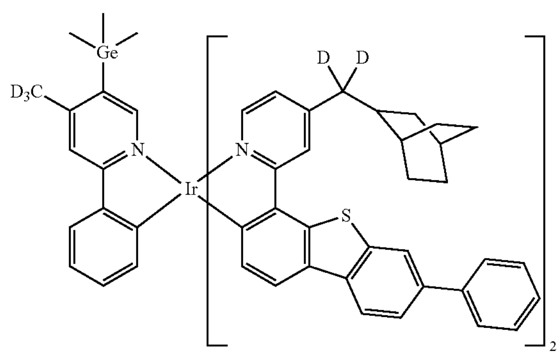
3995
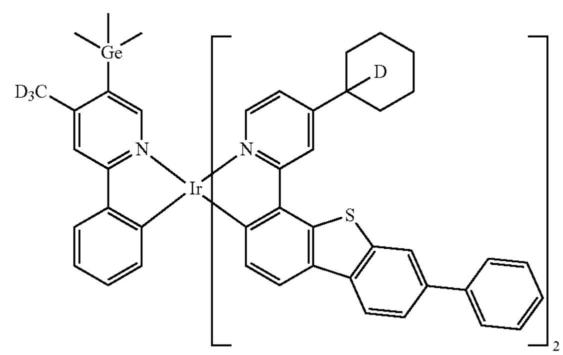
3996
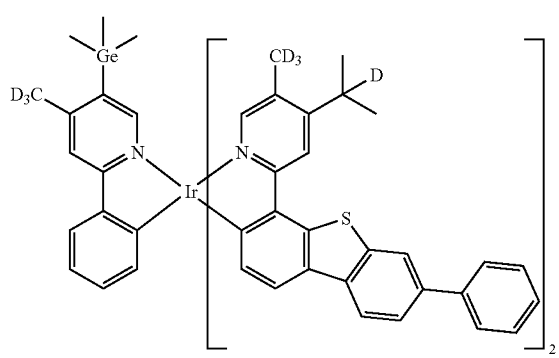
3997
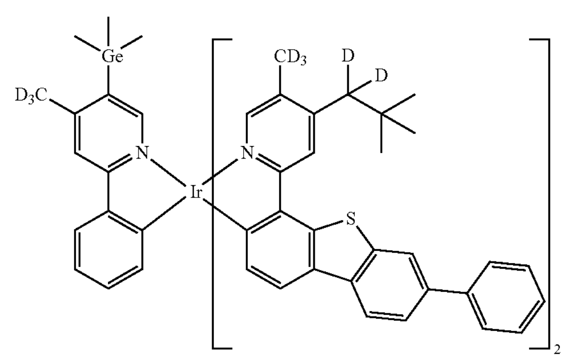
3998
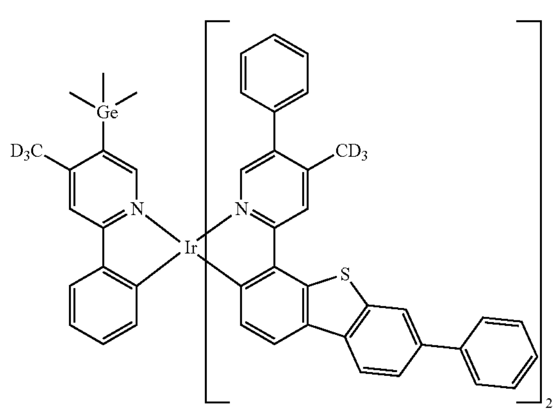
3999
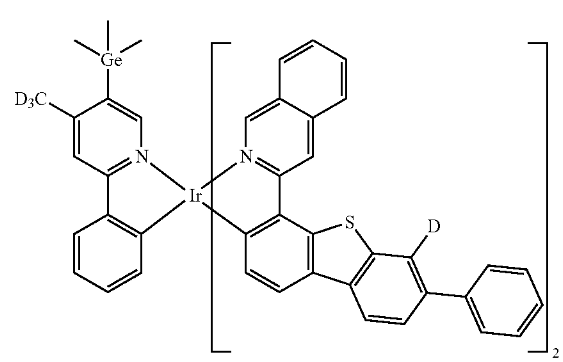

-continued
4000
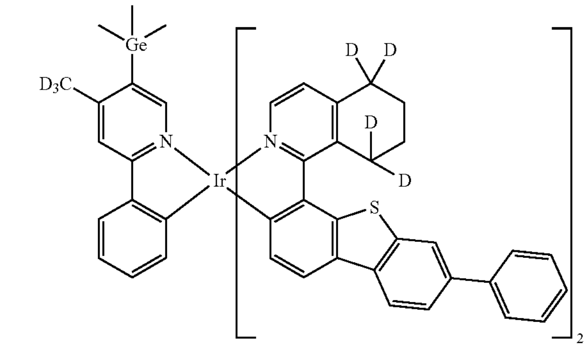
4001
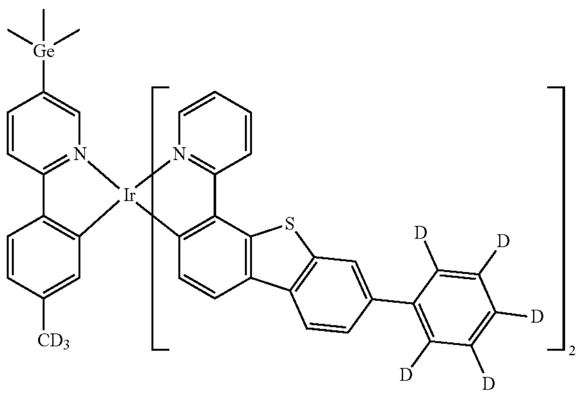
4002
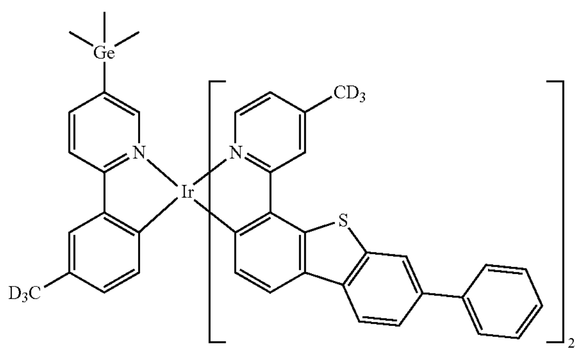
4003
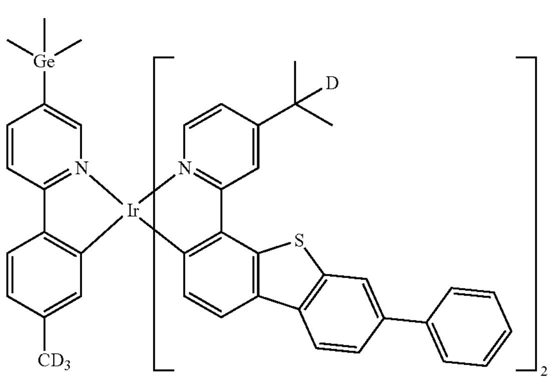
-continued
4004
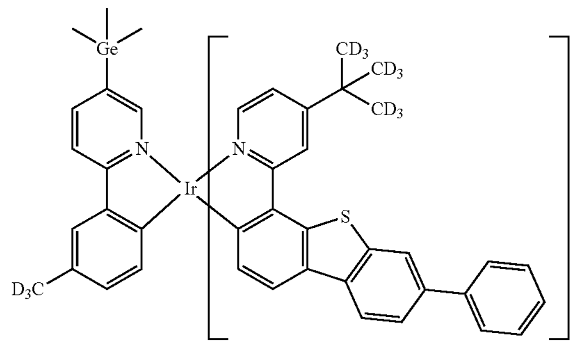
4005
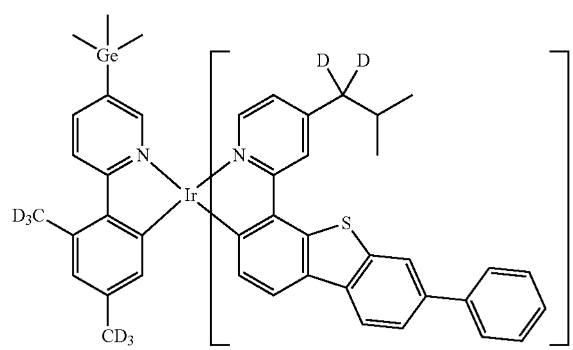
4006
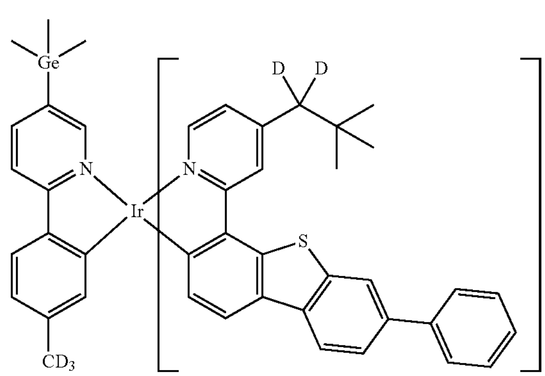

-continued
4007
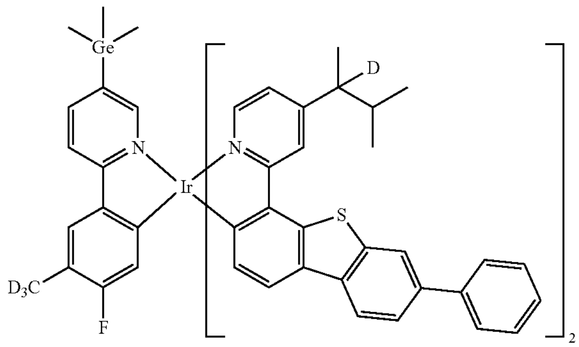
4008
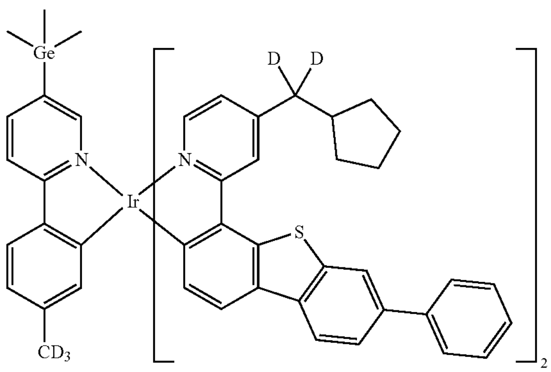
4009
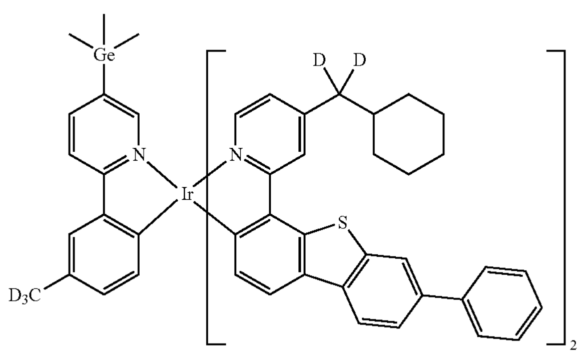
4010
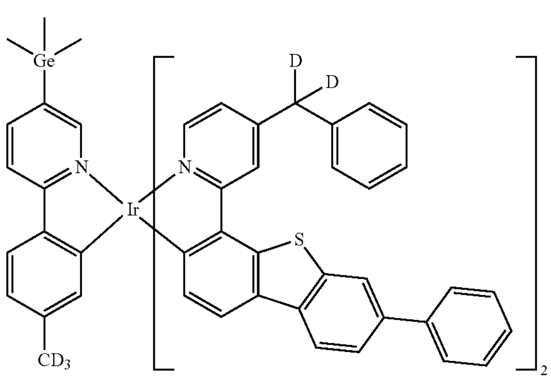
-continued
4011
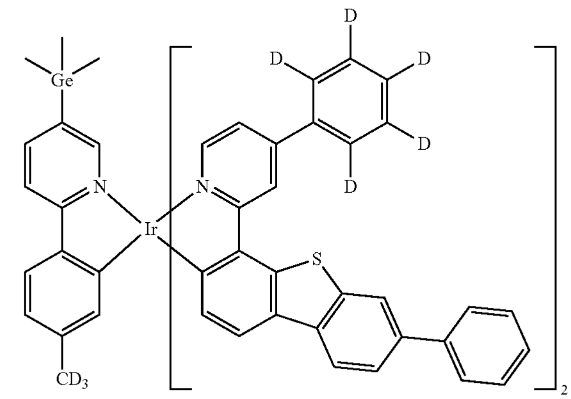
4012
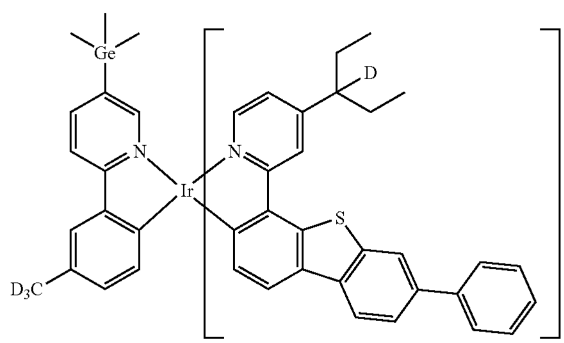
4013
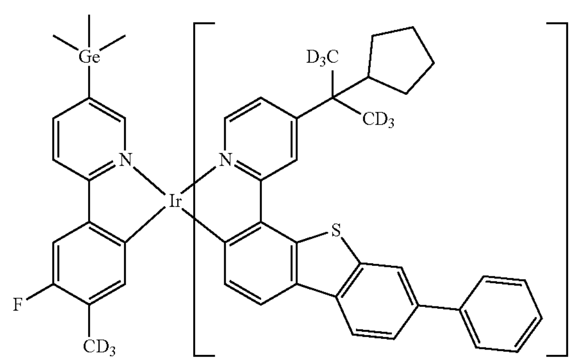
4014
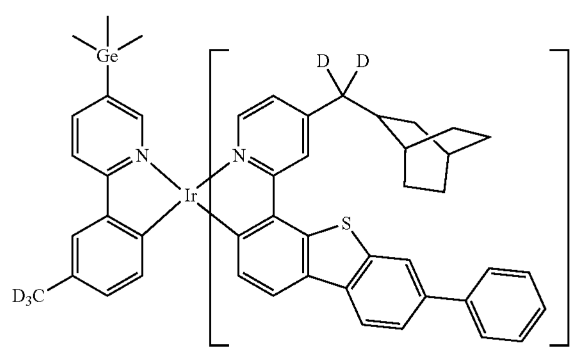

-continued
4015
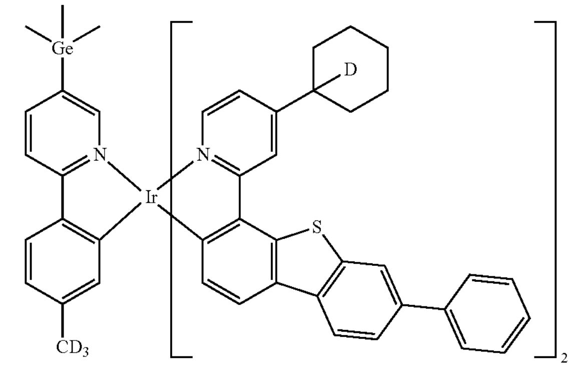
4016
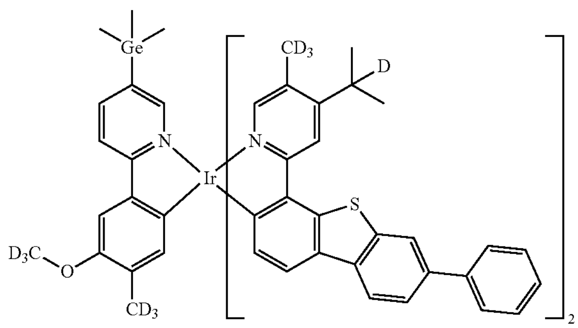
4017
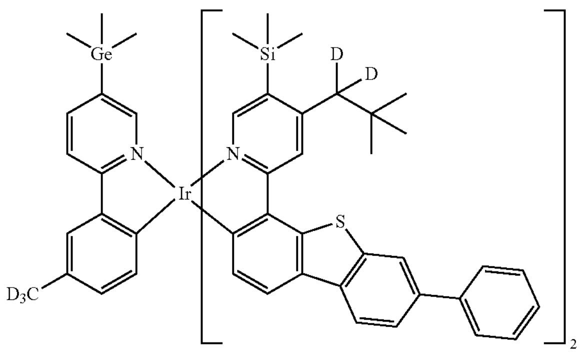
4018
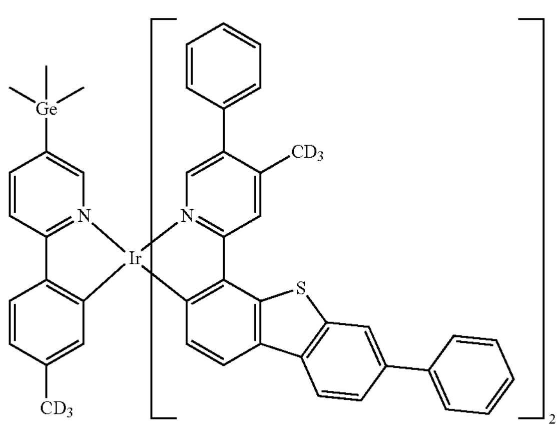
-continued
4019
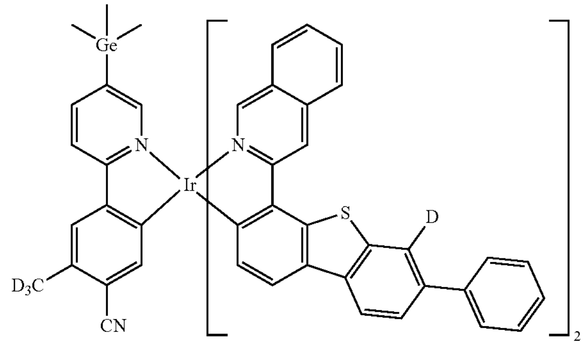
4020
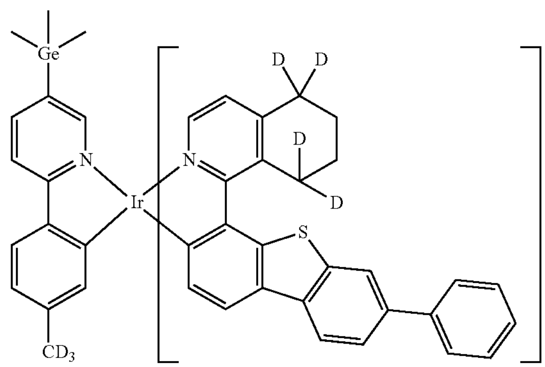
4021
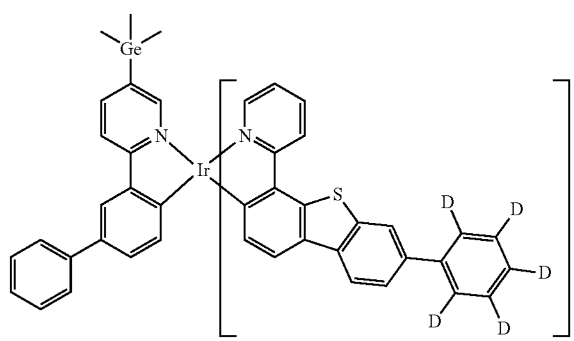
4022
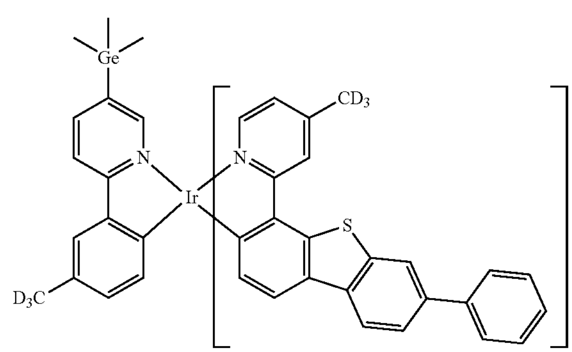

-continued
4023
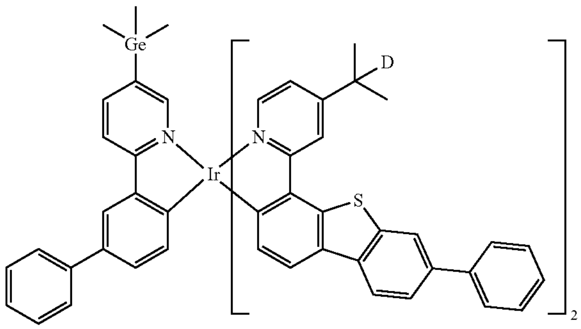
4024
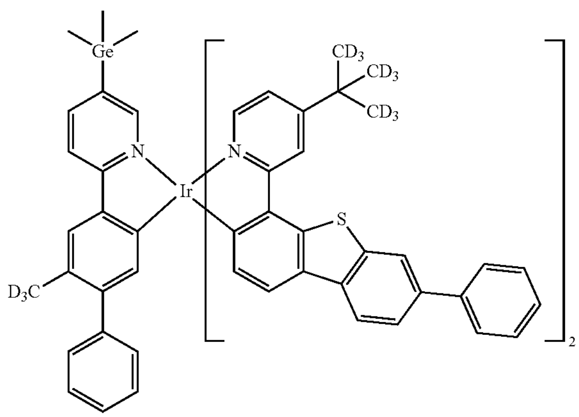
4025
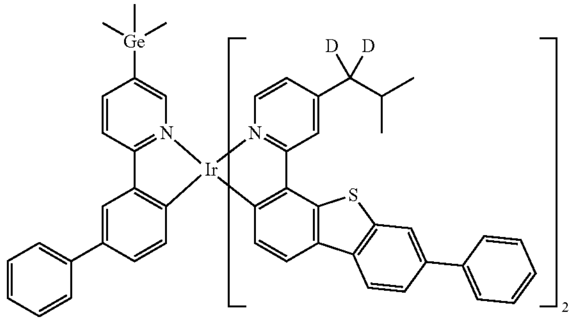
4026
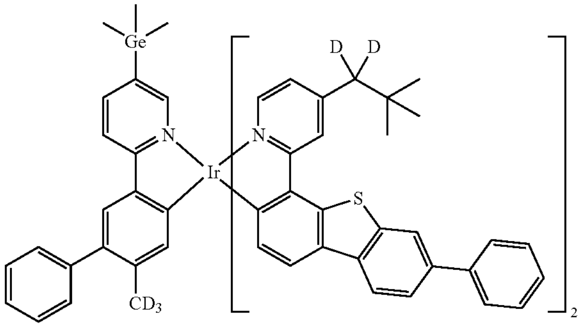
-continued
4027
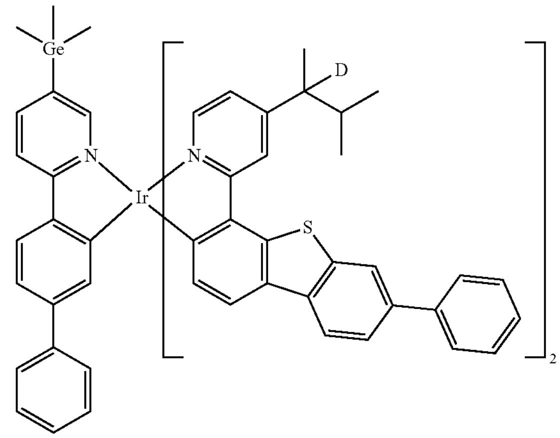
4028
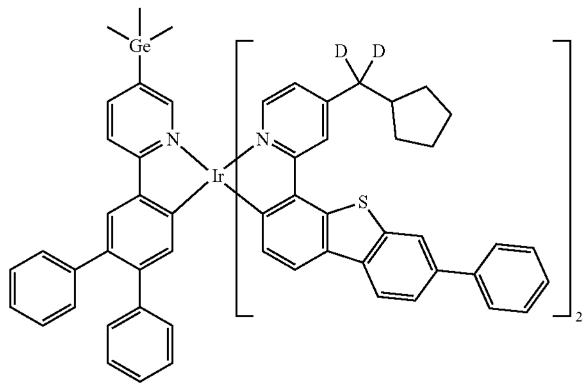
4029
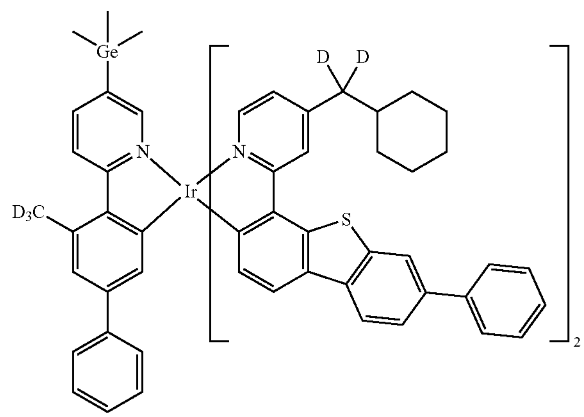
4030
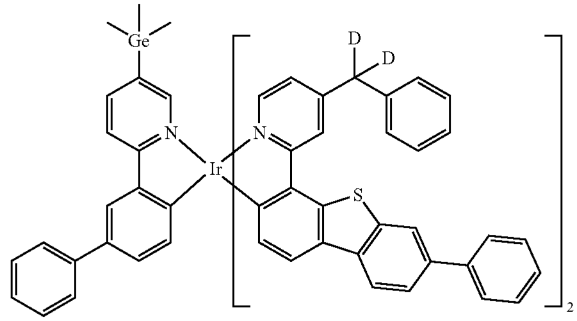

-continued
4031
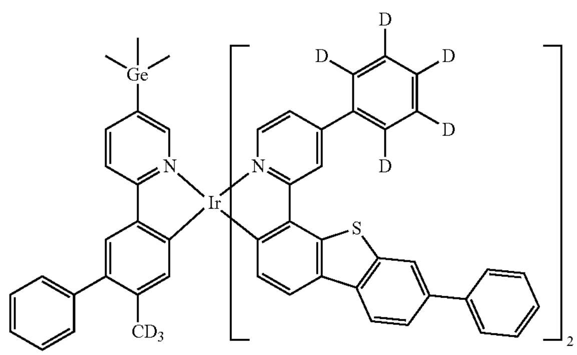
4032
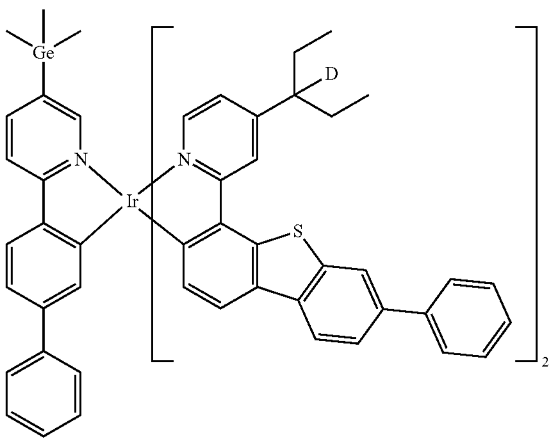
4033
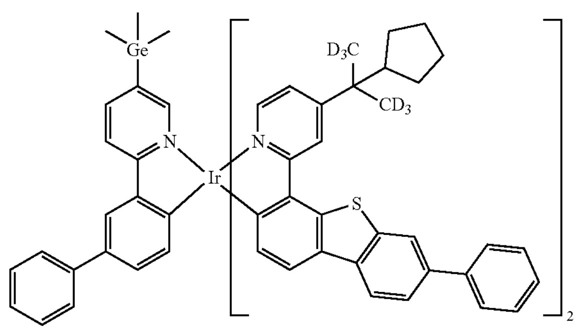
4034
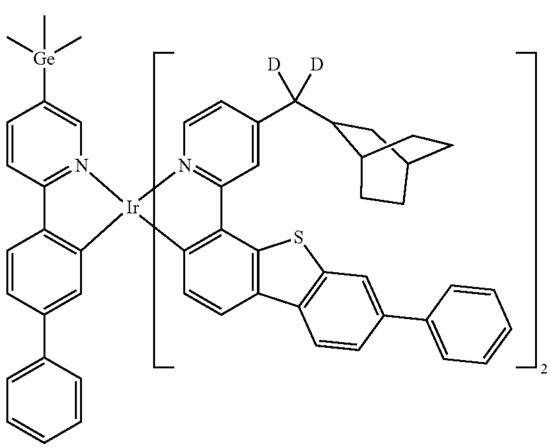
-continued
4035
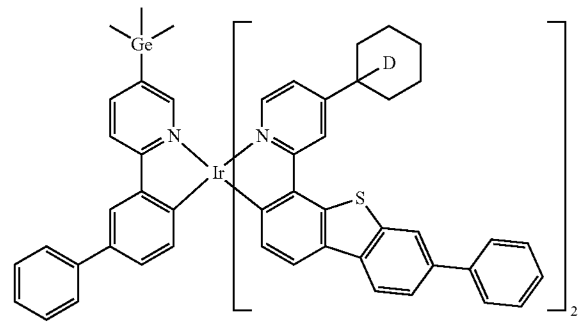
4036
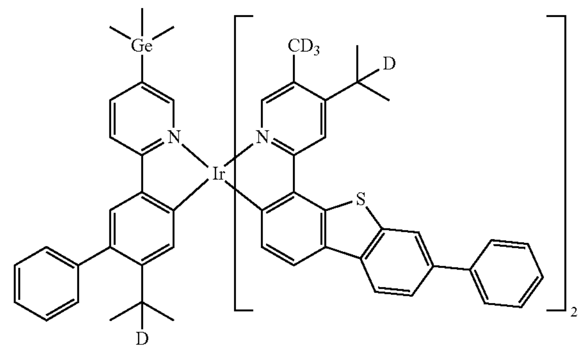
4037
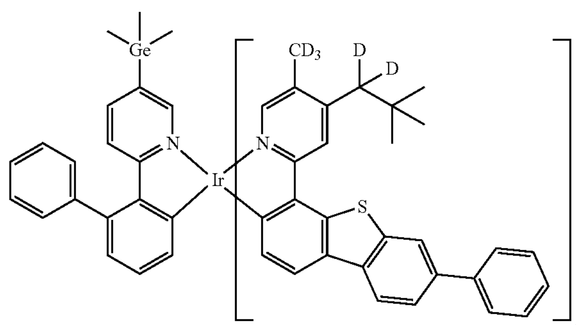
4038
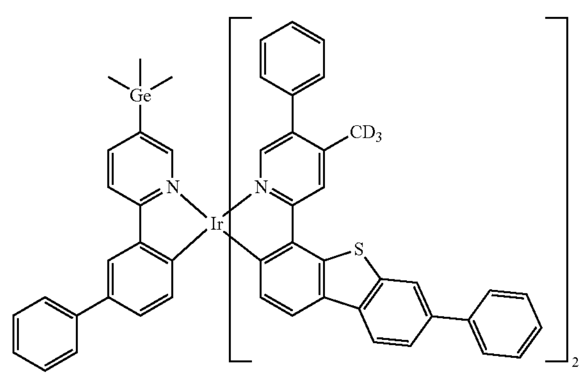

-continued
4039
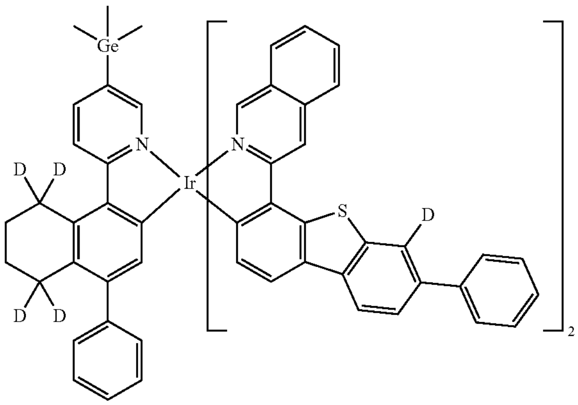
4040
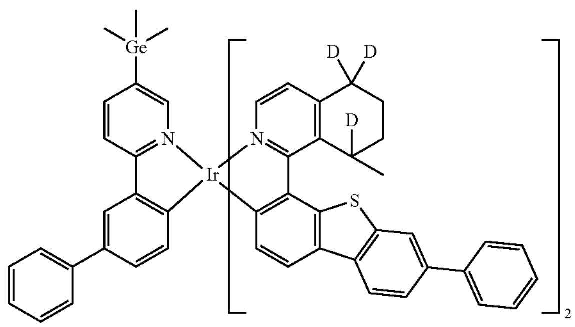
4041
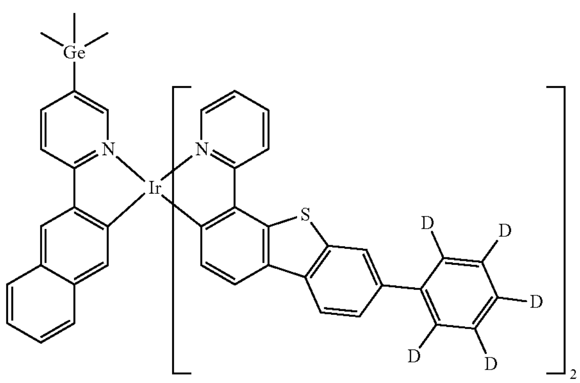
4042
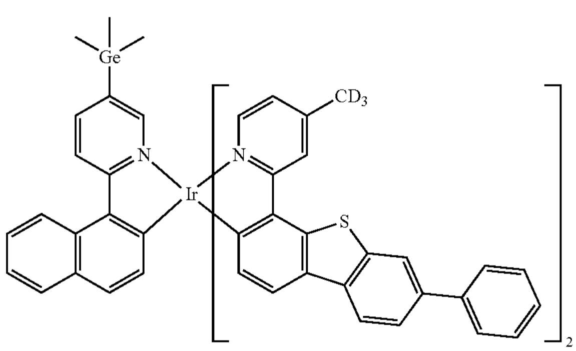
-continued
4043
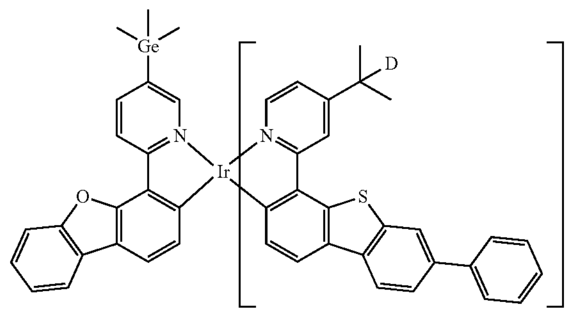
4044
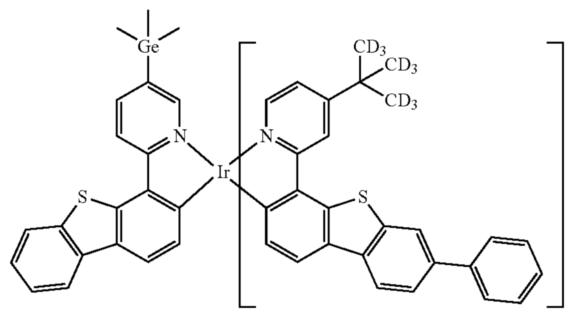
4045
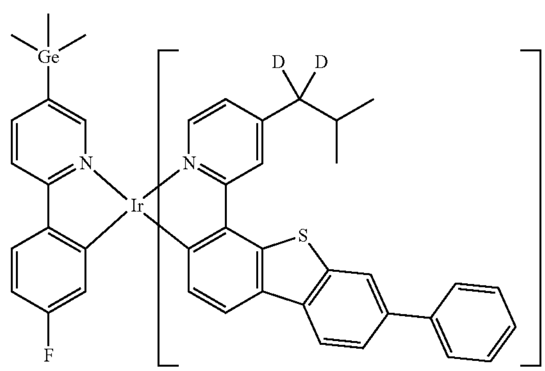
4046
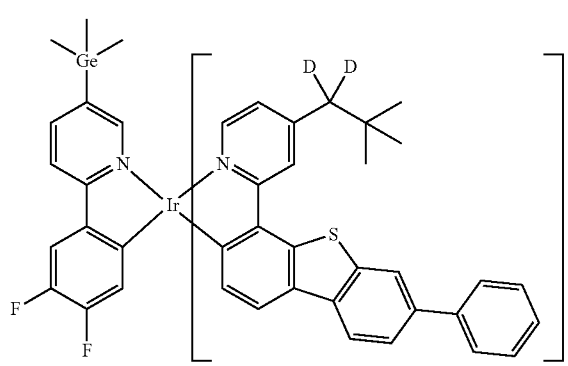

-continued
4047
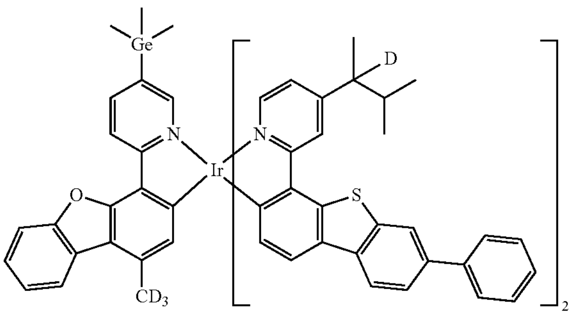
4048
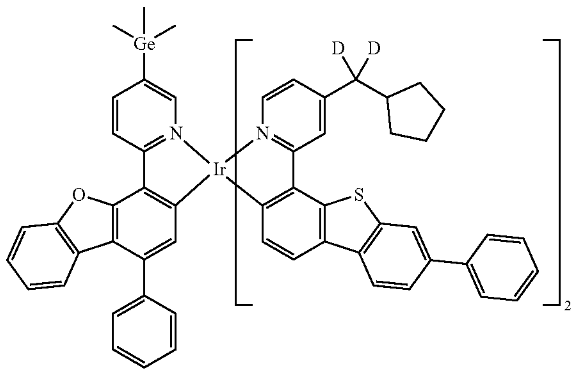
4049
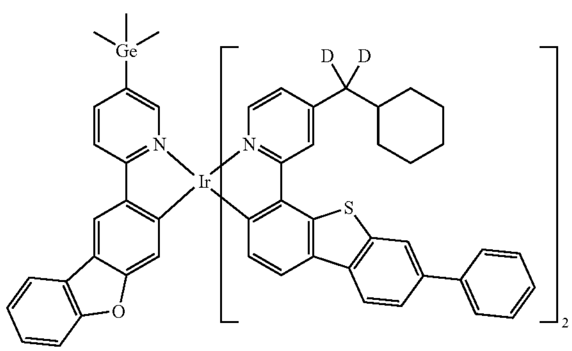
4050
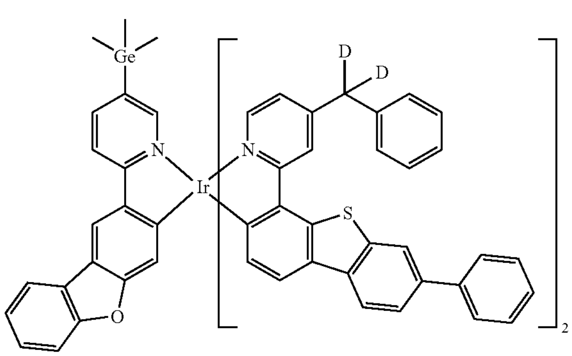
-continued
4051
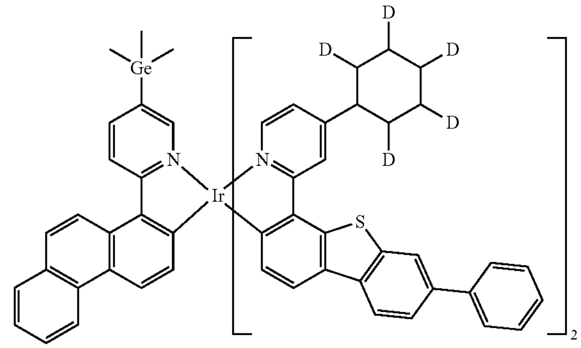
4052
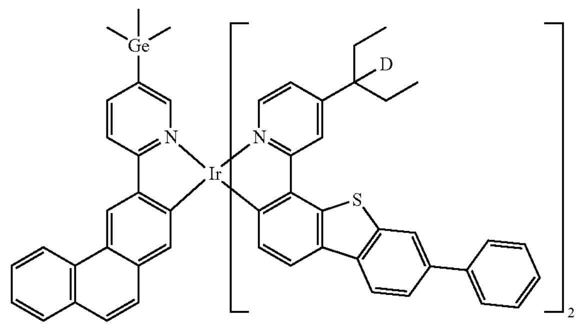
4053
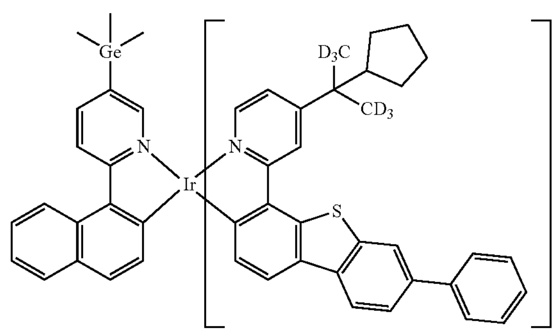
4054
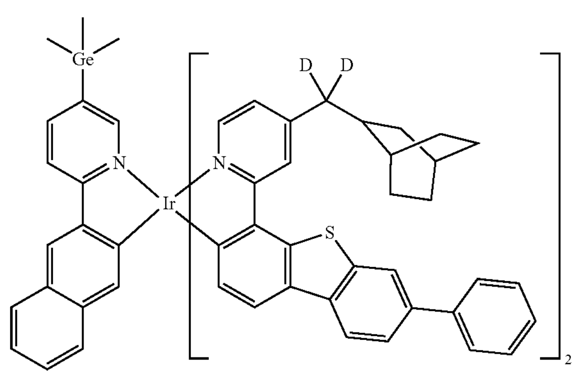

-continued
4055
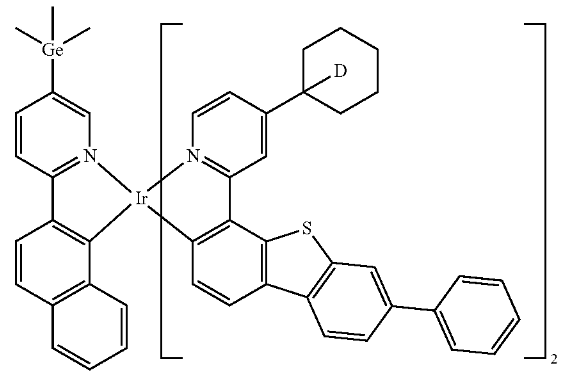
4056
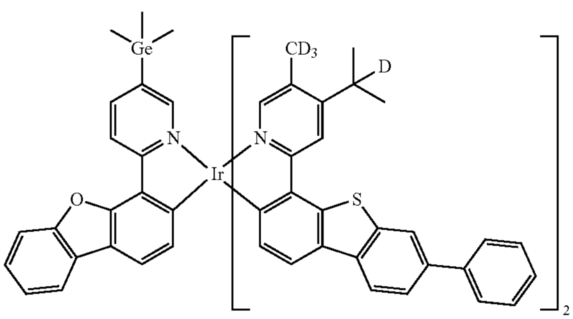
4057
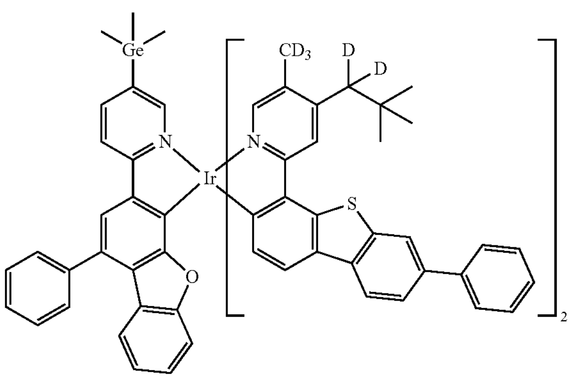
4058
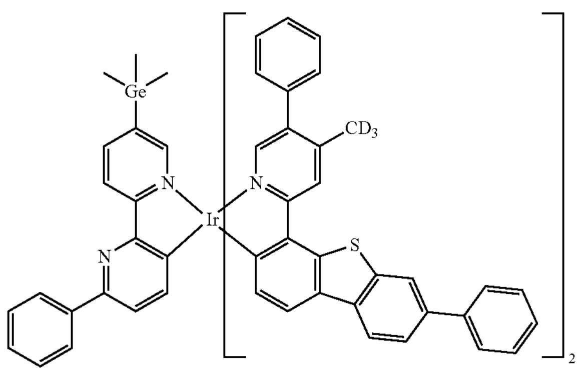
-continued
4059
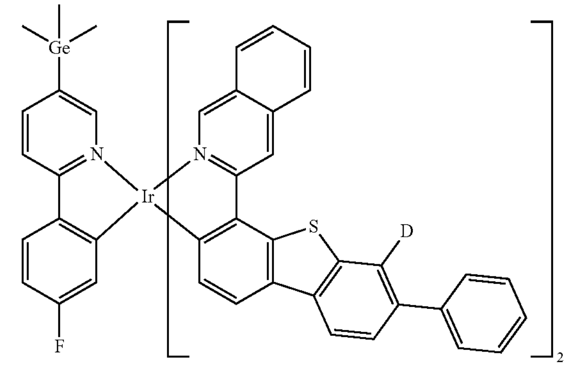
4060
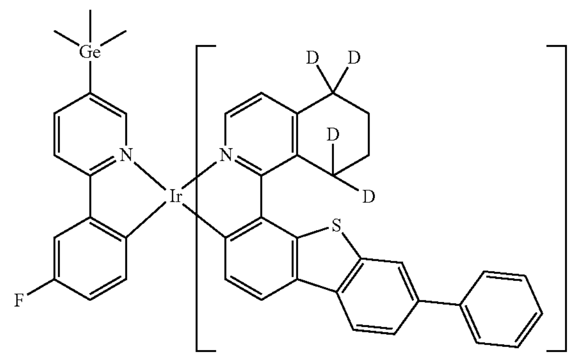
4061
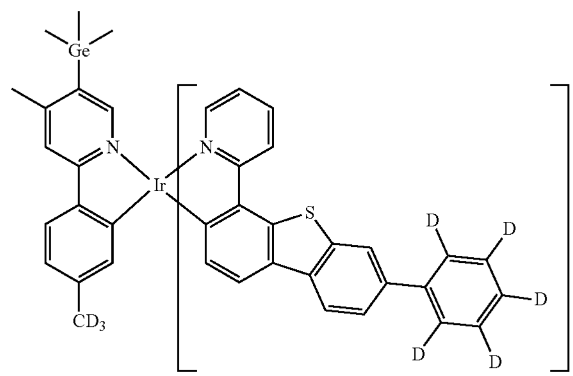
4062
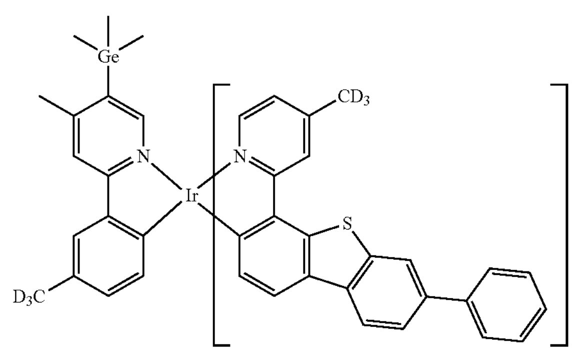

-continued
4063
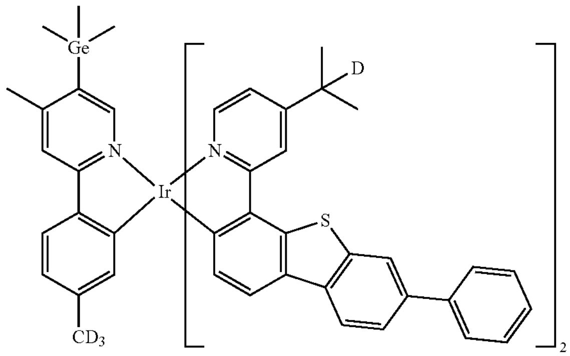
4064
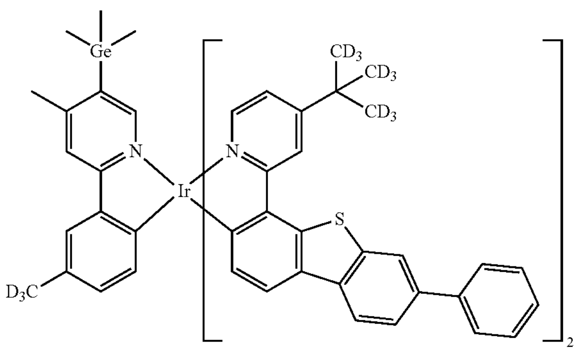
4065
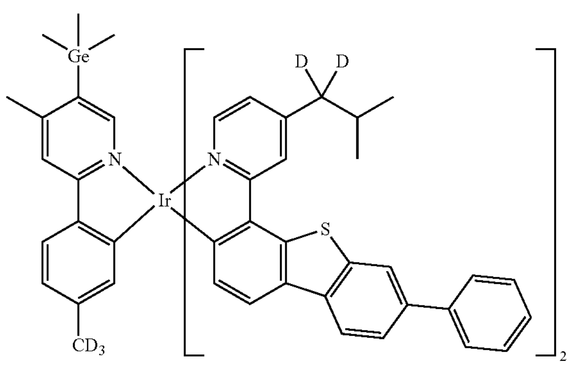
4066
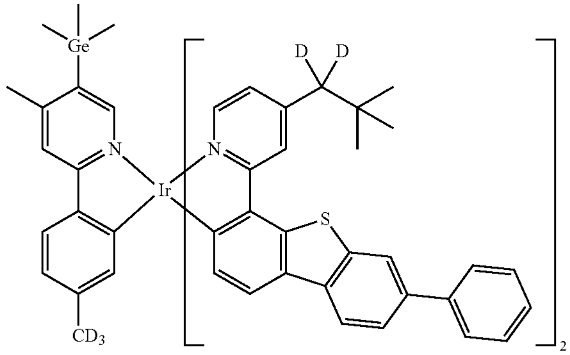
-continued
4067
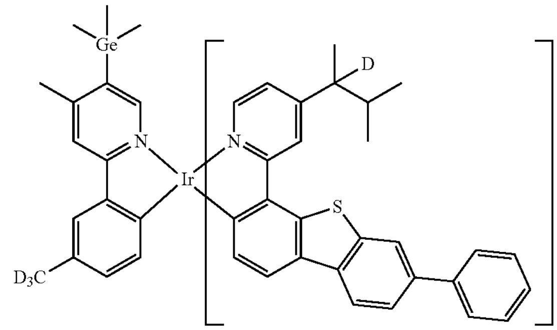
4068
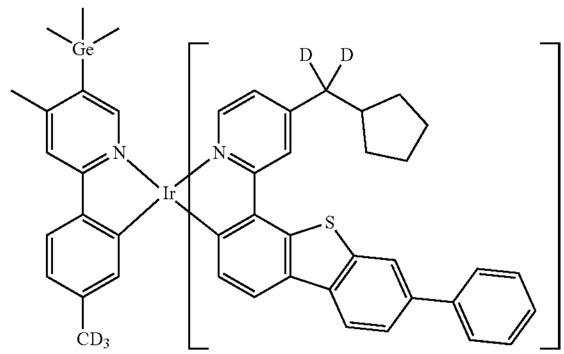
4069
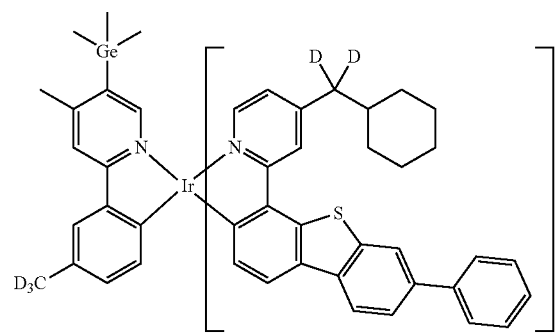
4070
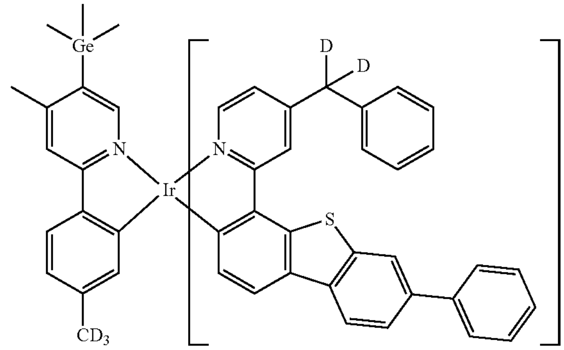

-continued
4071
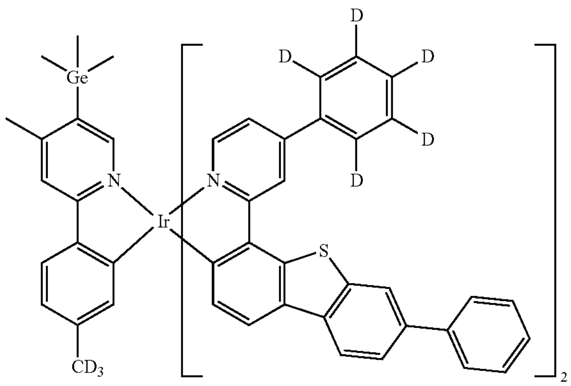
4072
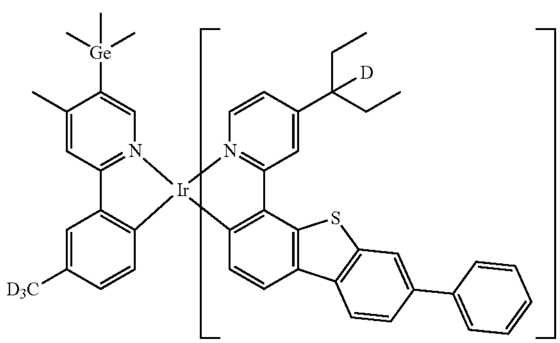
4073
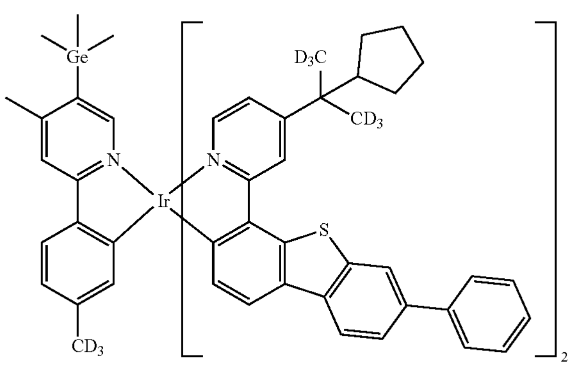
4074
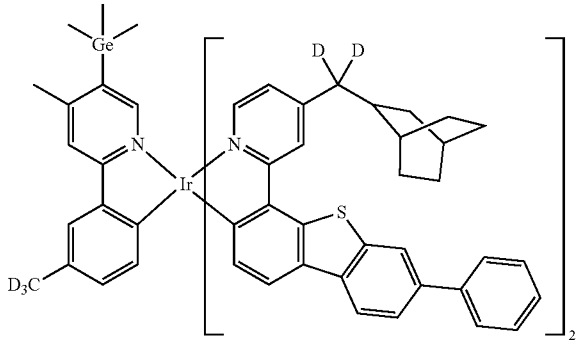
-continued
4075
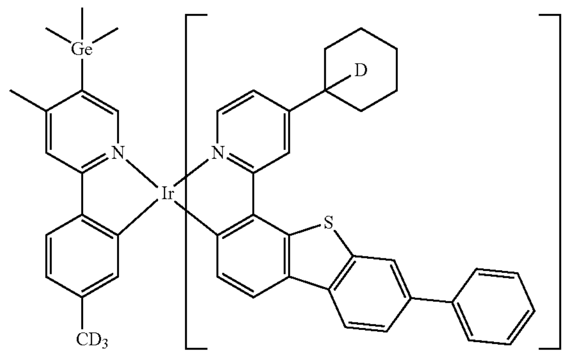
4076
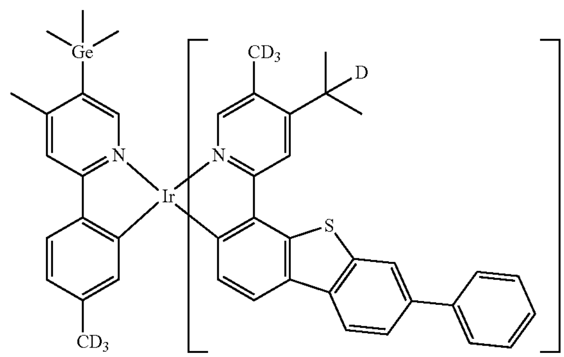
4077
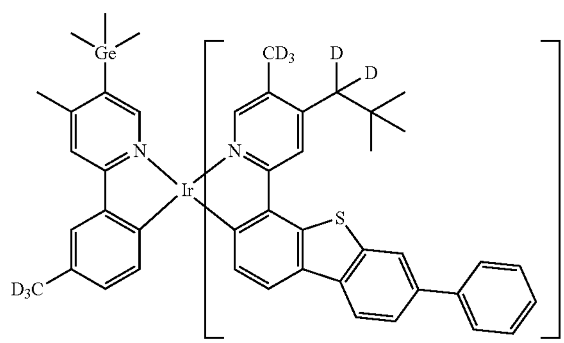
4078
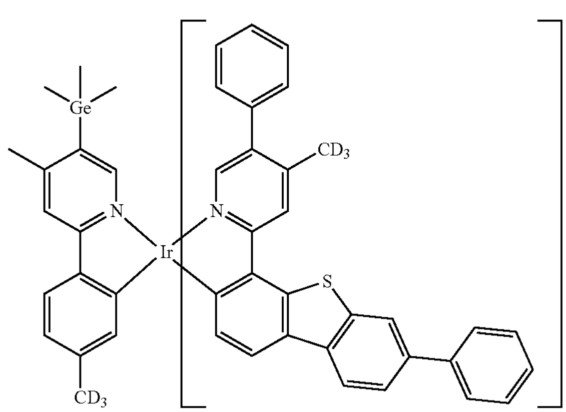

-continued
4079
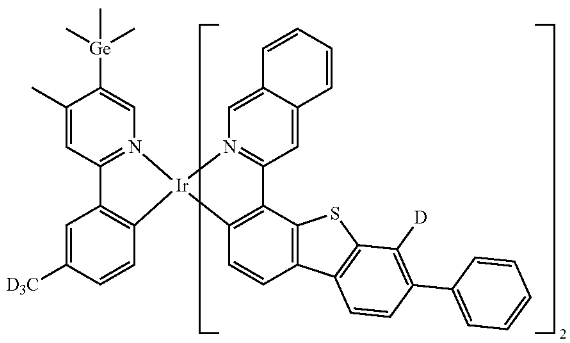
4080
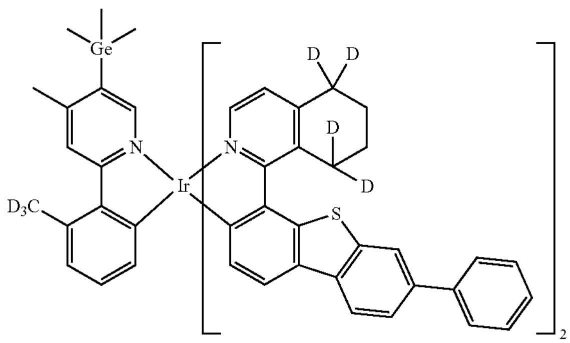
4081
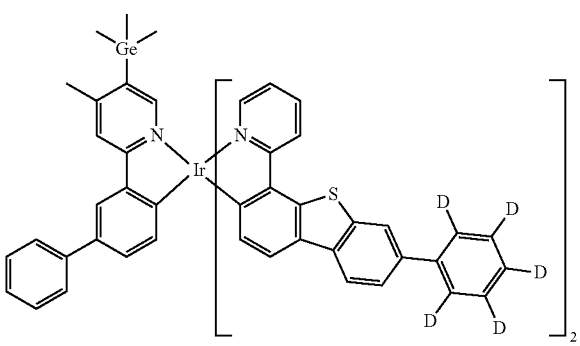
4082
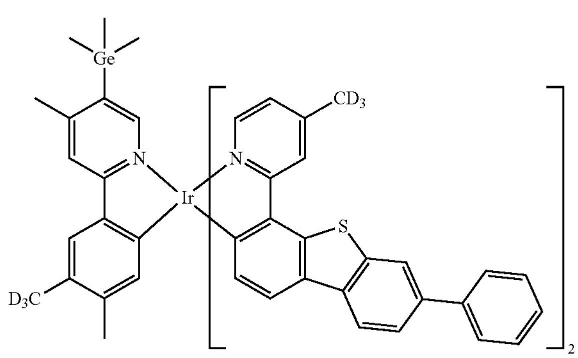
-continued
4083
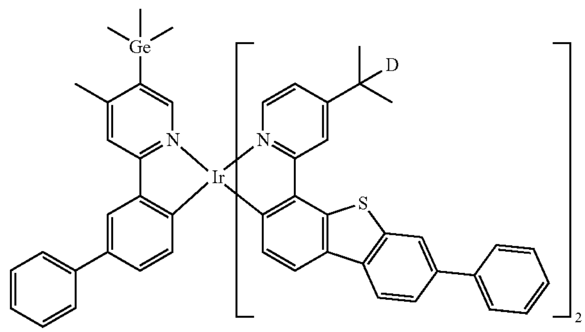
4084
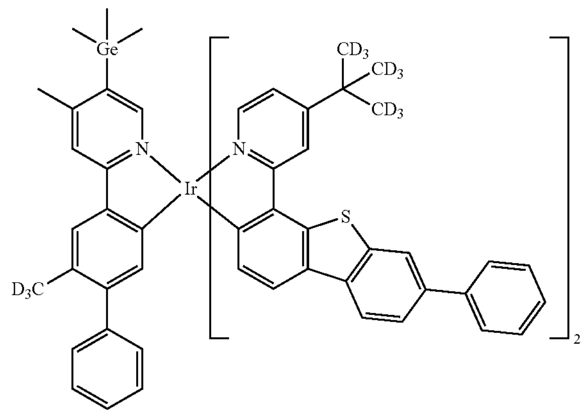
4085
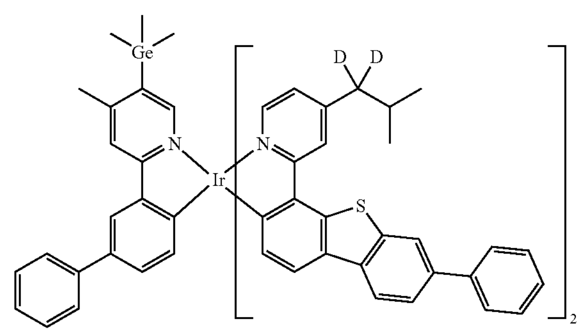
4086
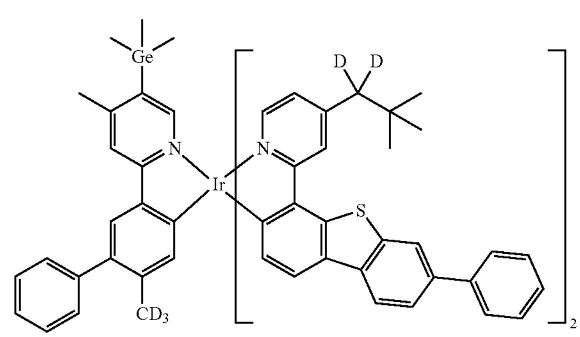

-continued
4087
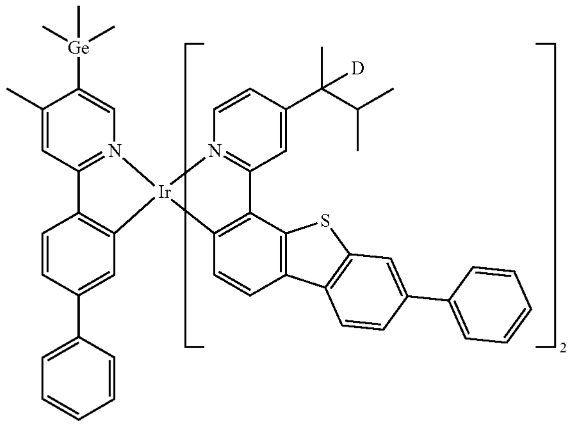
4088
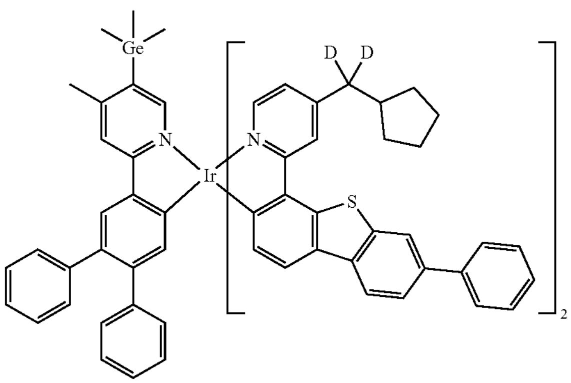
4089
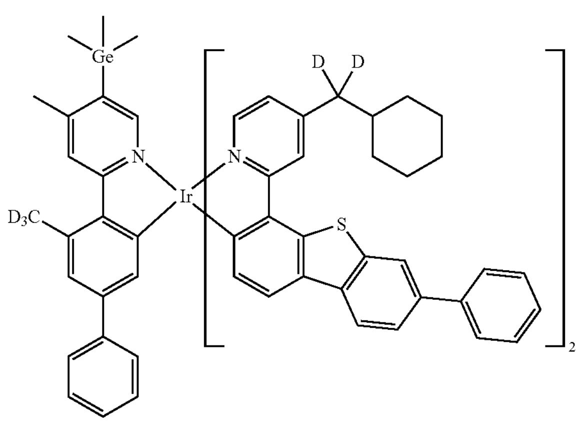
4090
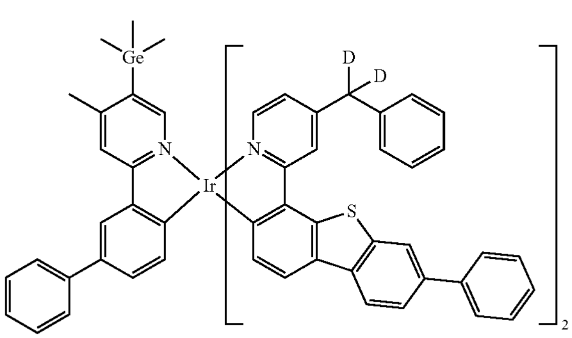
-continued
4091
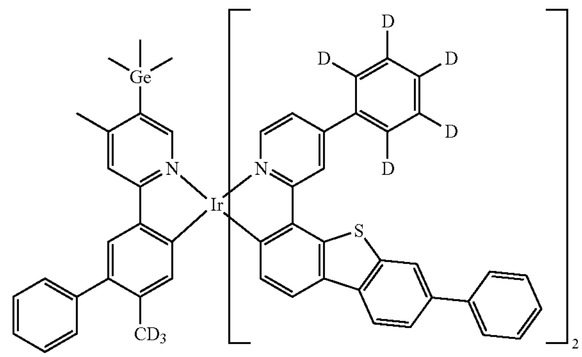
4092
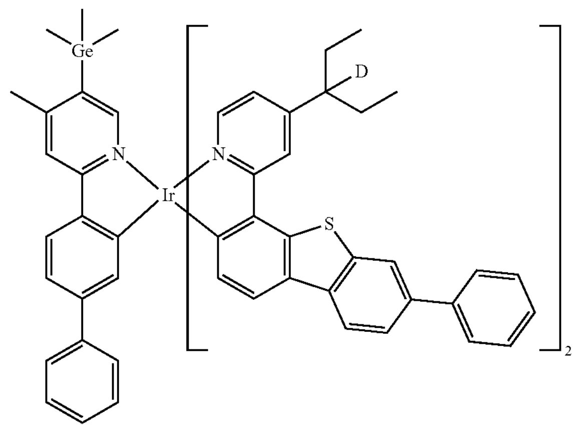
4093
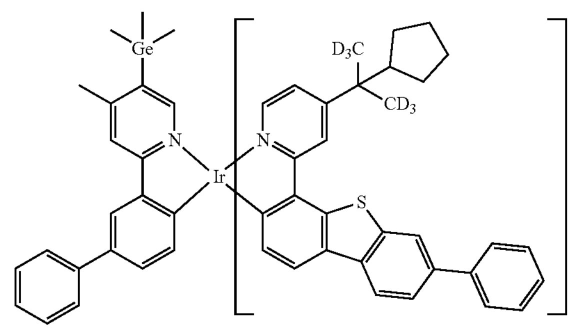
4094
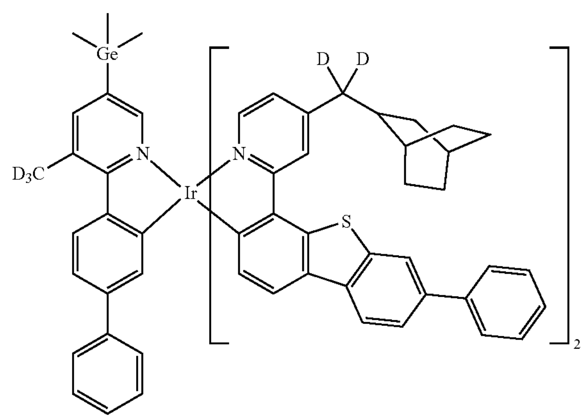

-continued
4095
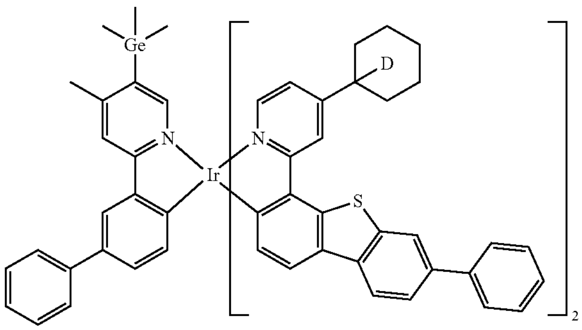
4096
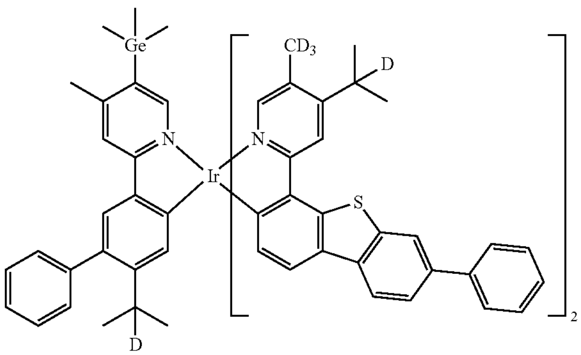
4097
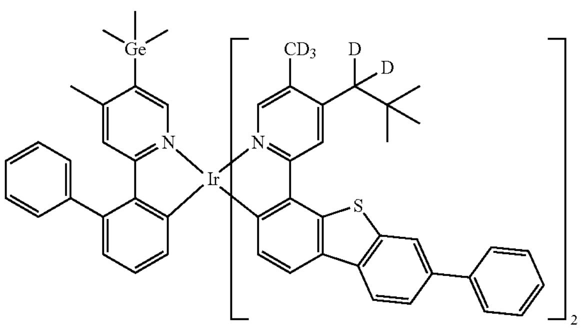
4098
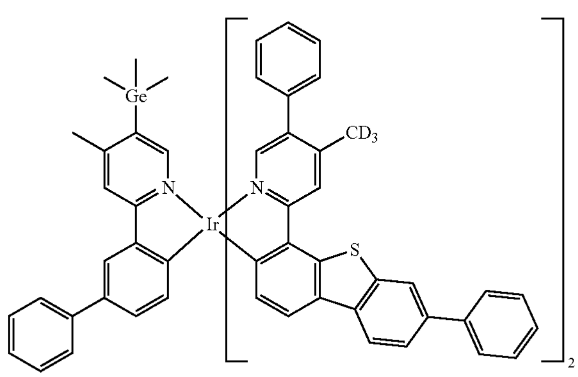
-continued
4099
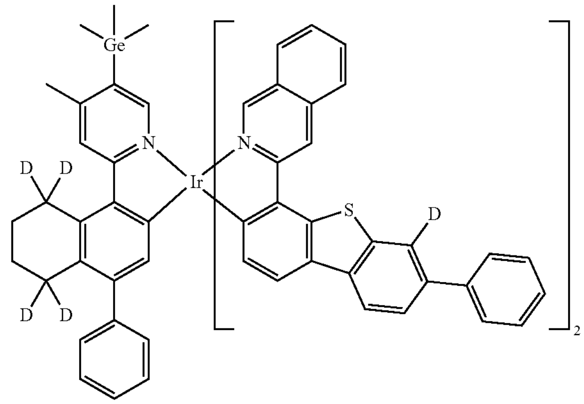
4100
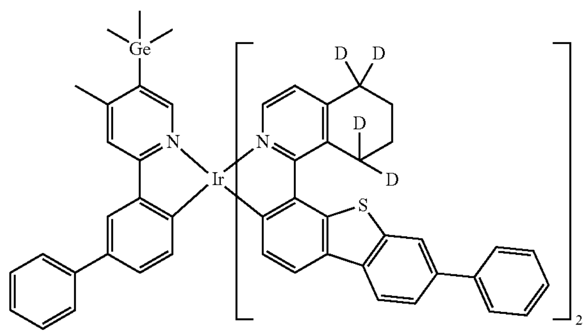
4101
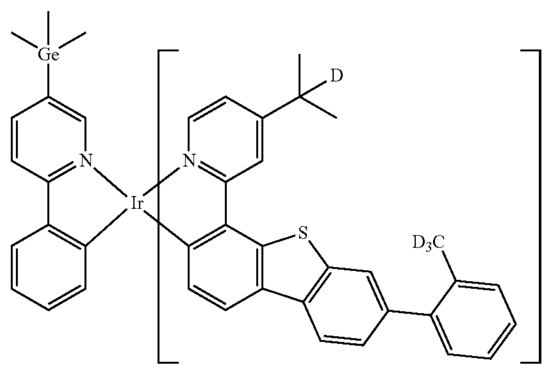
4102
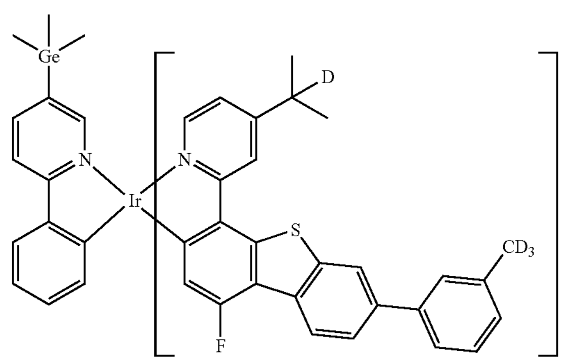

4103
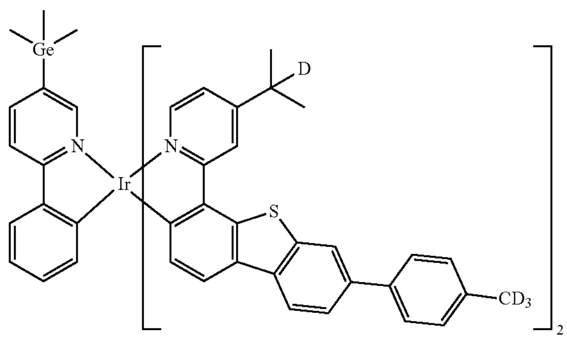
4104
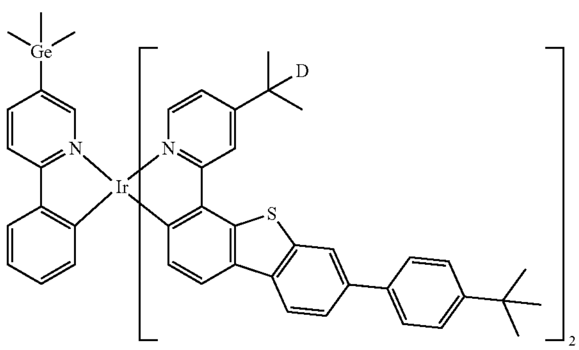
4105
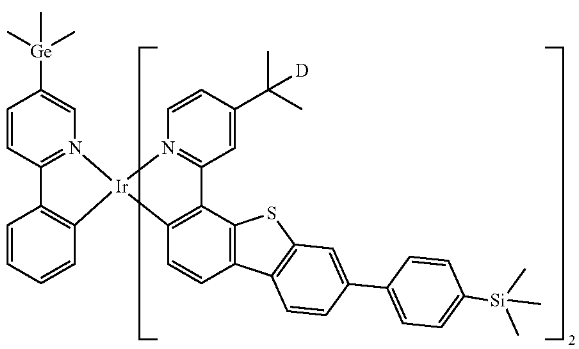
4106
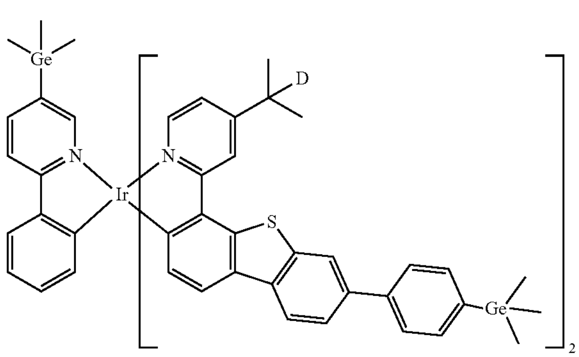
4107
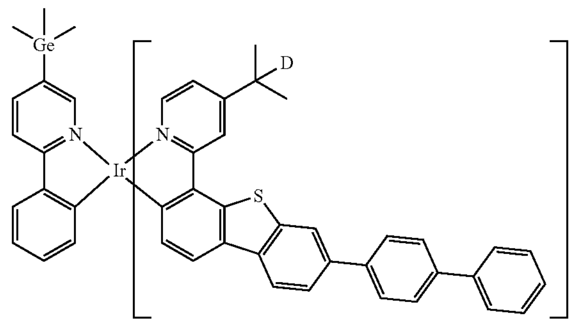
4108
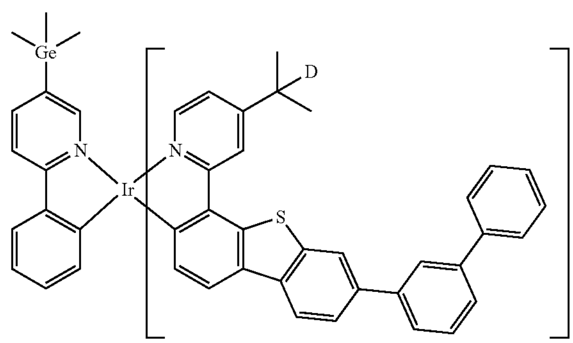
4109
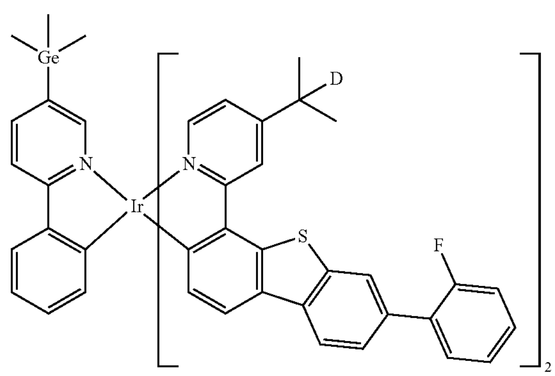
4110
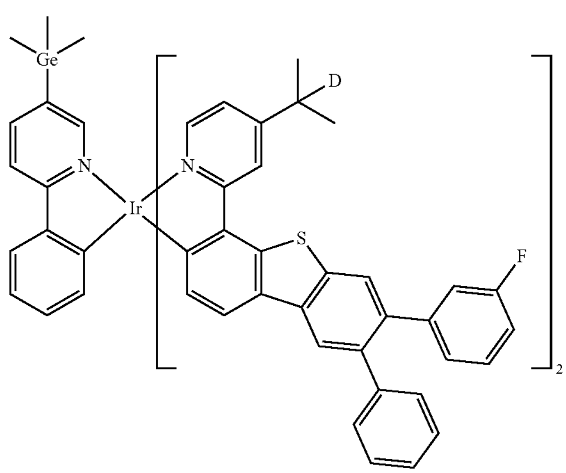

4111
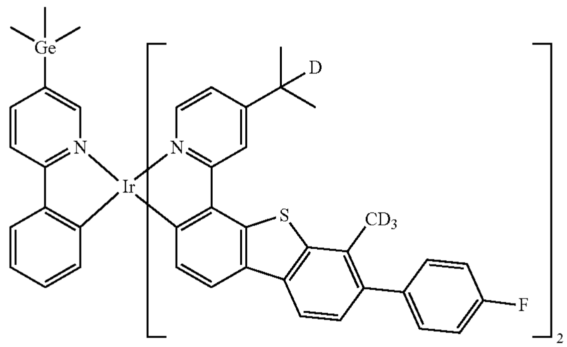
4112
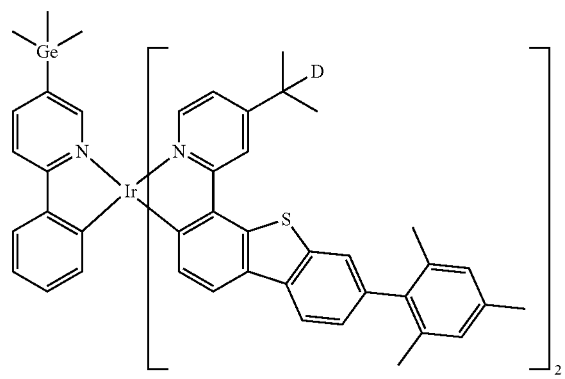
4113
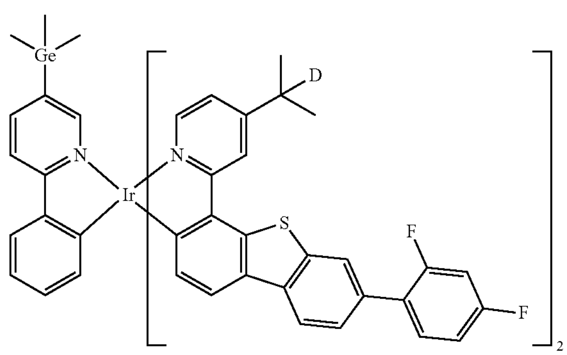
4114
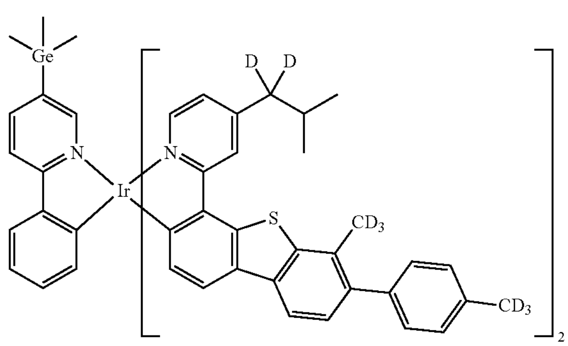
4115
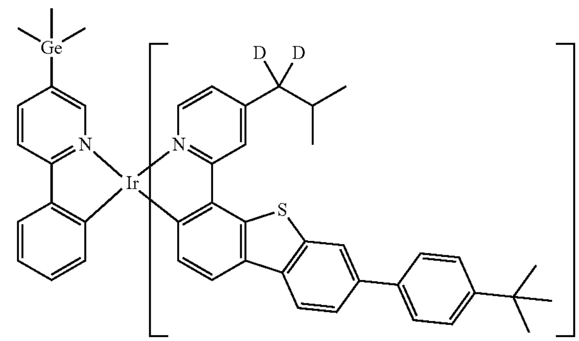
4116
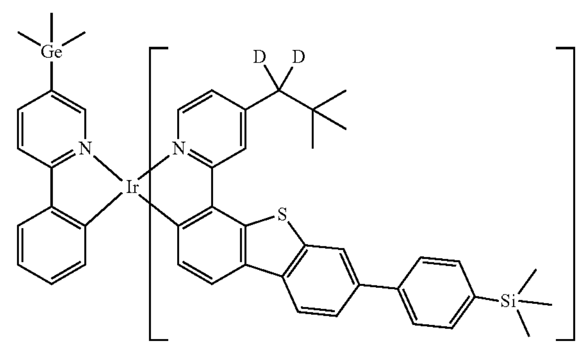
4117
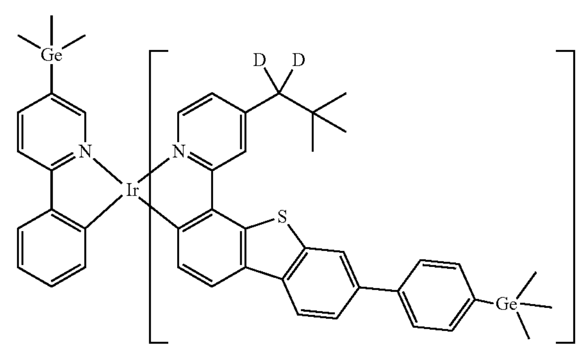
4118
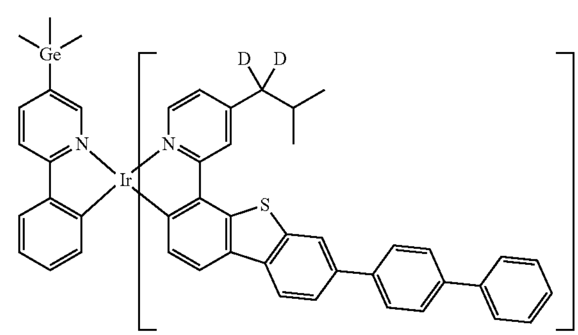

-continued
4119
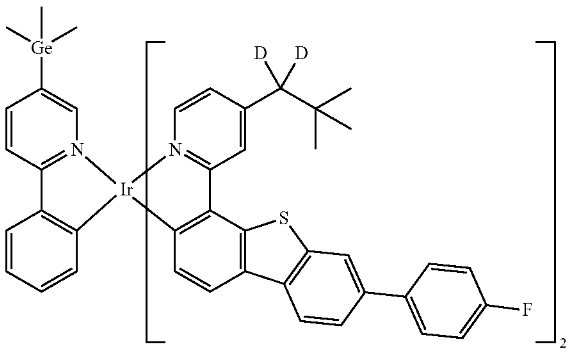
4120
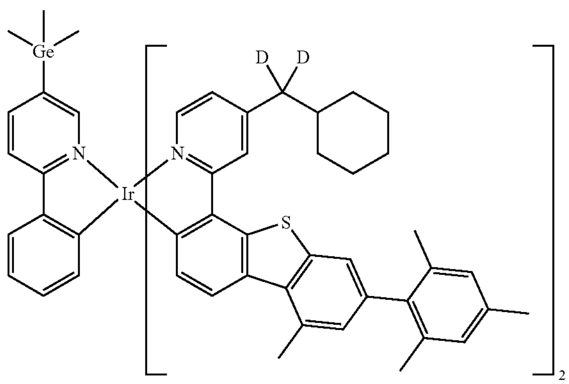
4121
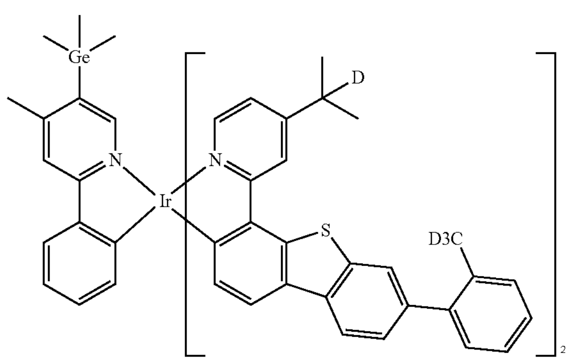
4122
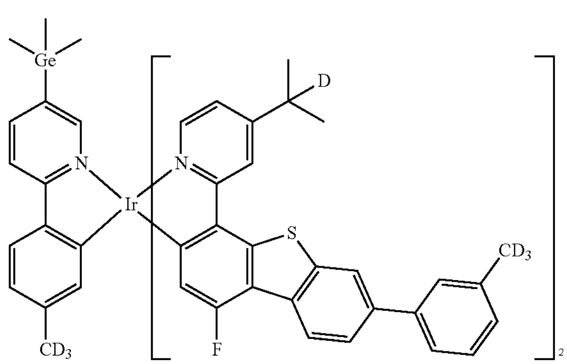
-continued
4123
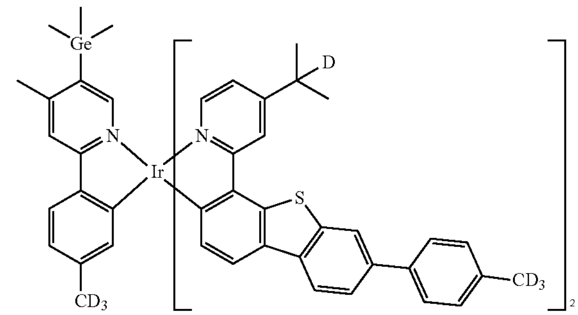
4124
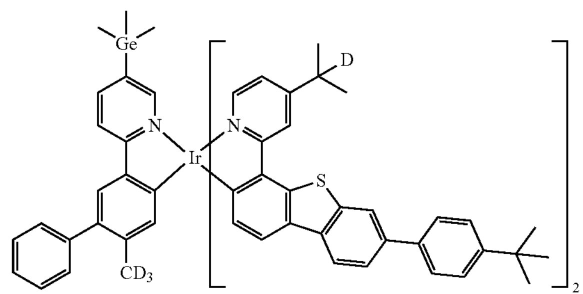
4125
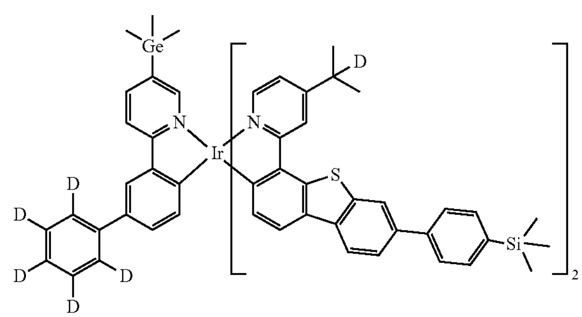
4126
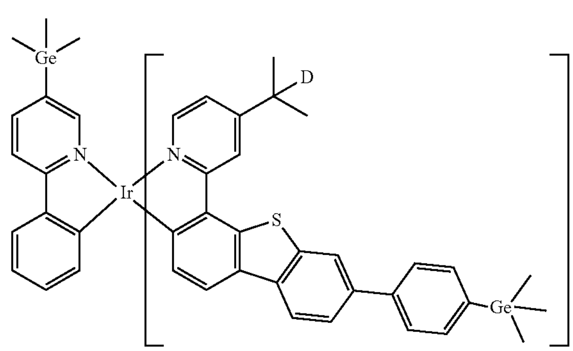

-continued
4127
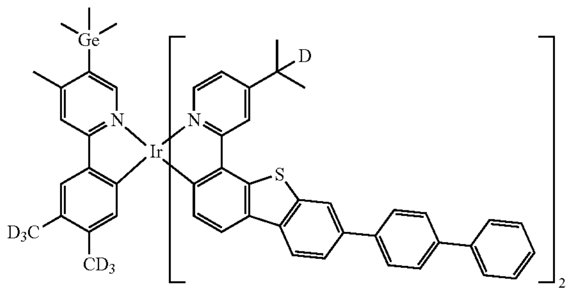
4128
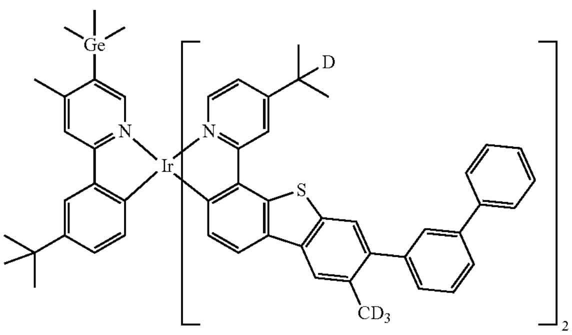
4129
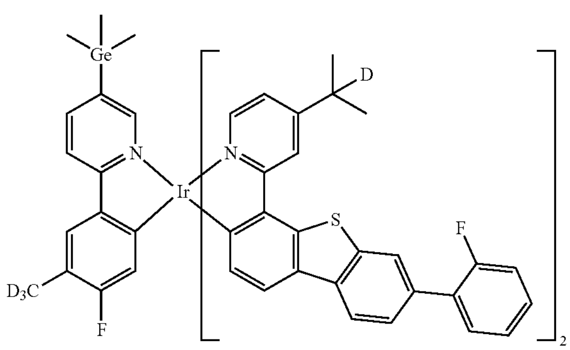
4130
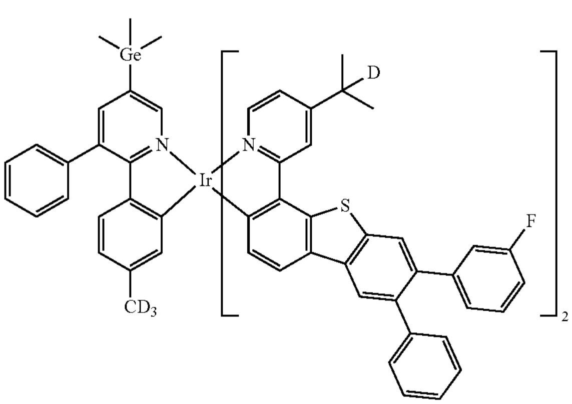
-continued
4131
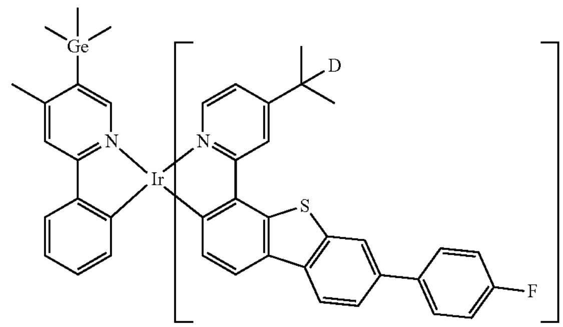
4132
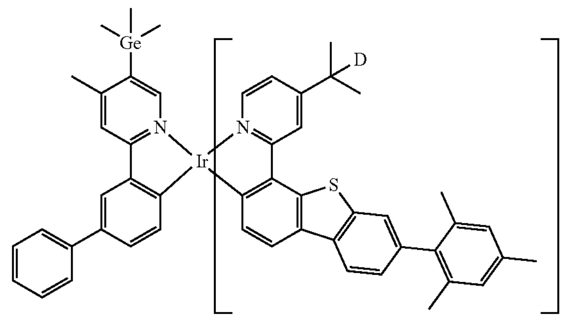
4133
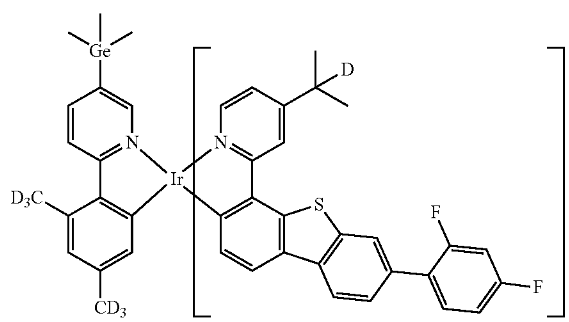
4134
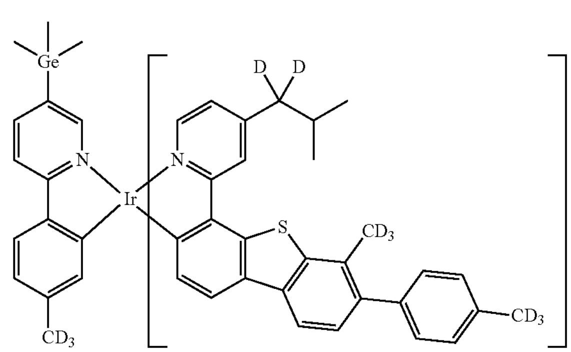

-continued
4135
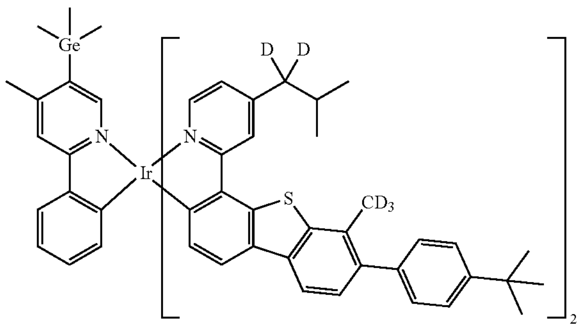
4136
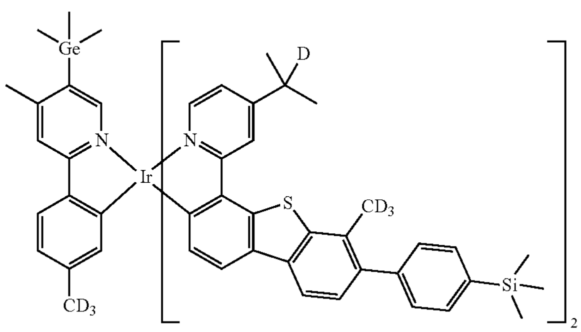
4137
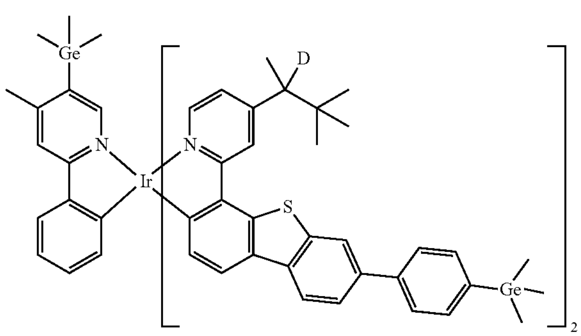
4138
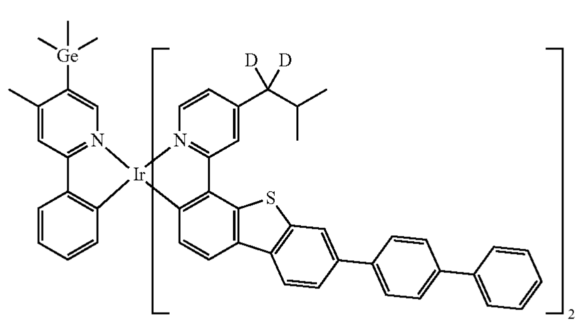
-continued
4139
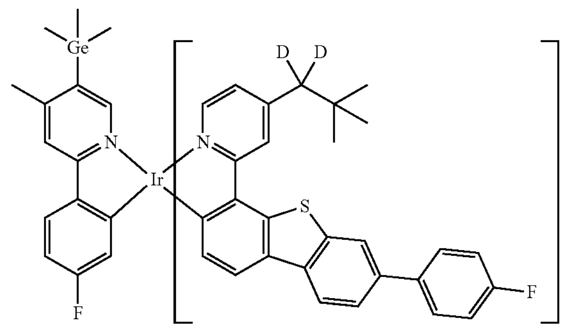
4140
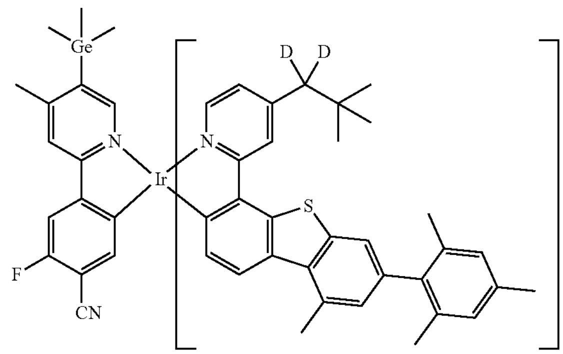
4141
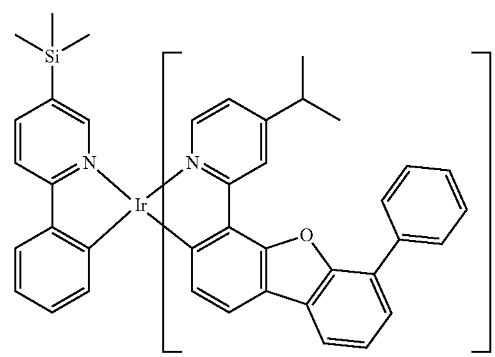
4142
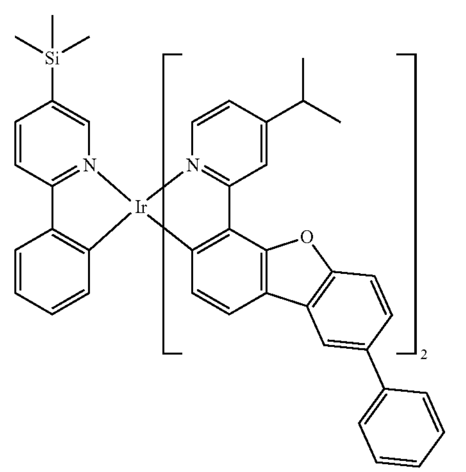

-continued
4143
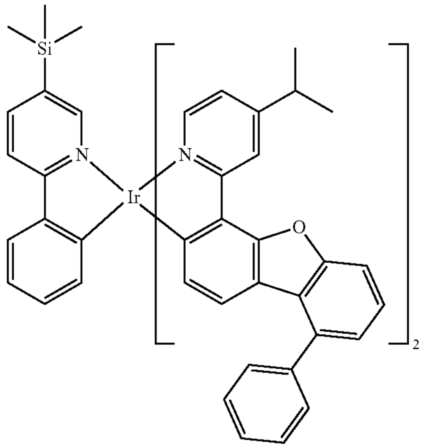
4144
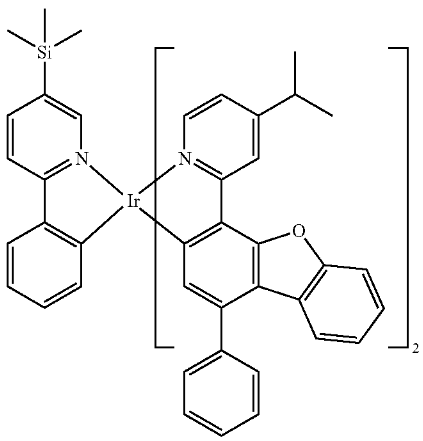
4145
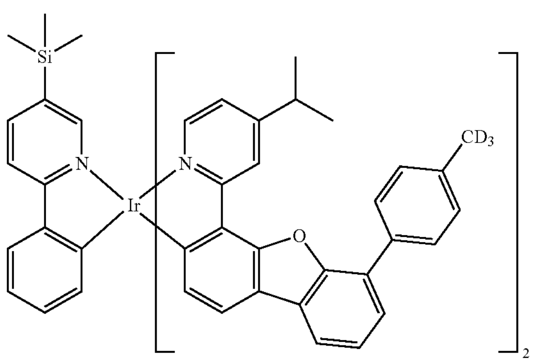
4146
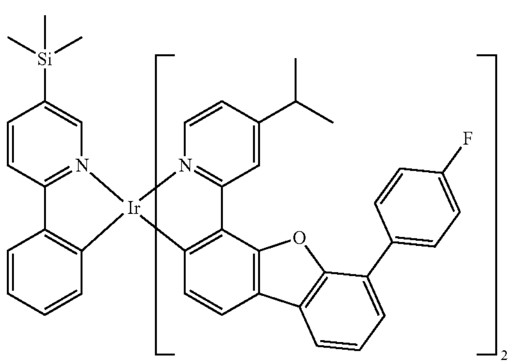
-continued
4147
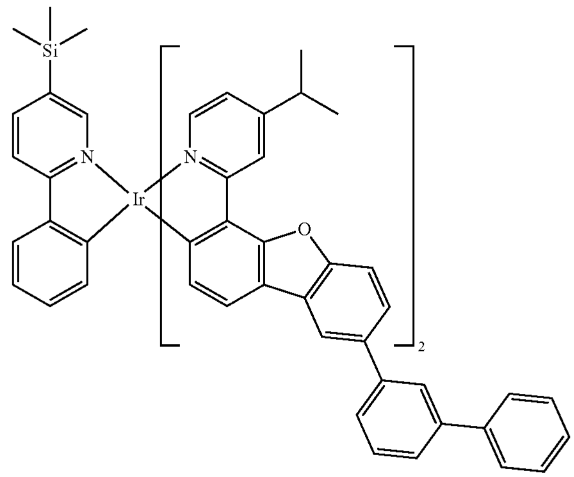
4148
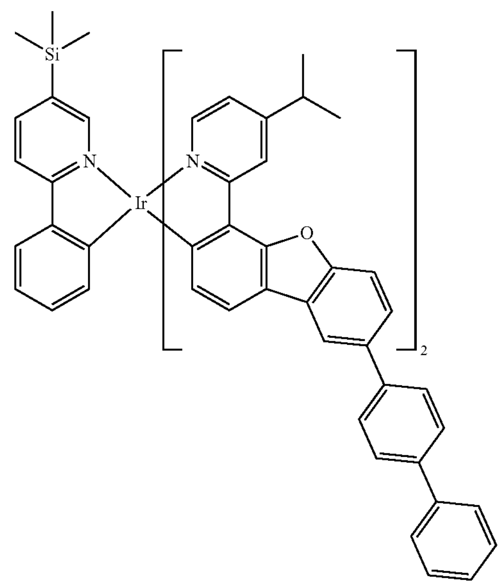
4149
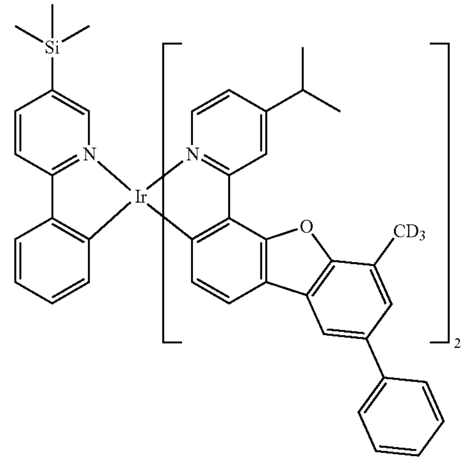

-continued
4150
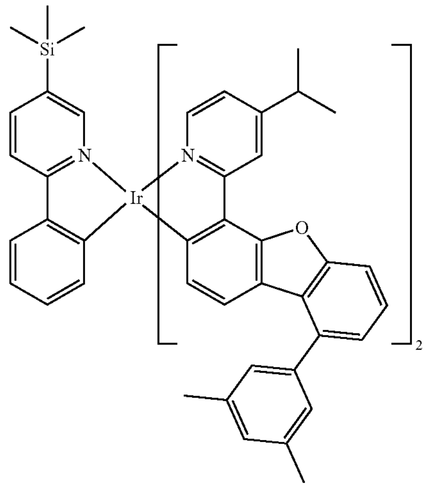
4151
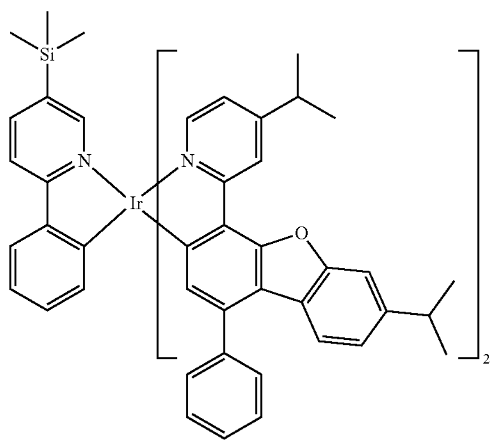
4152
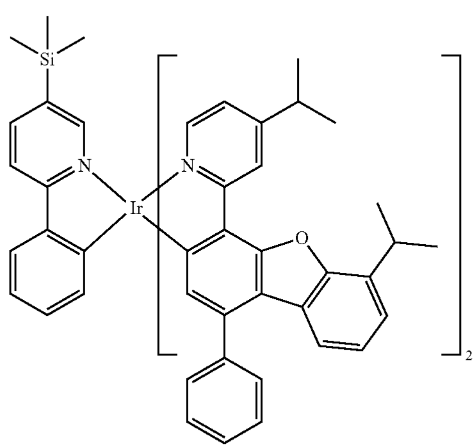
-continued
4153
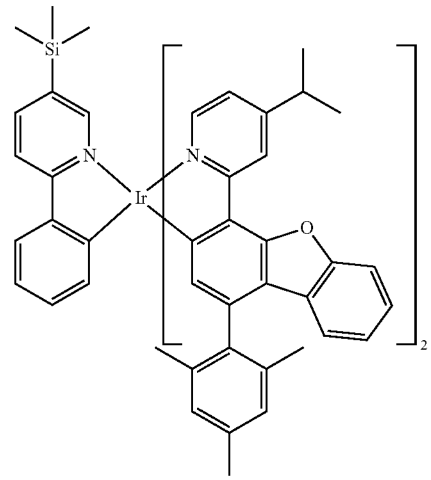
4154
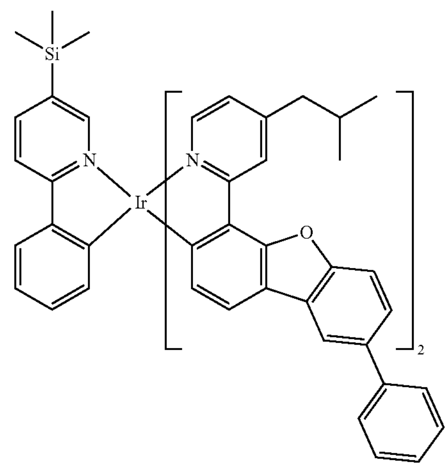
4155
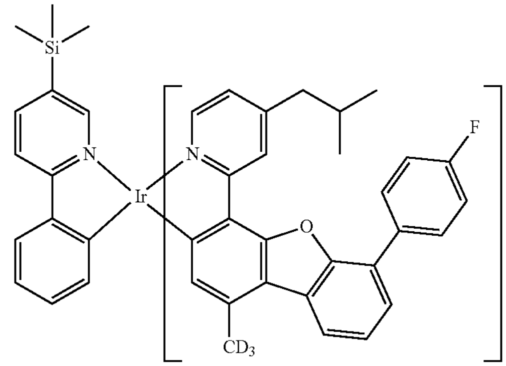

-continued
4156
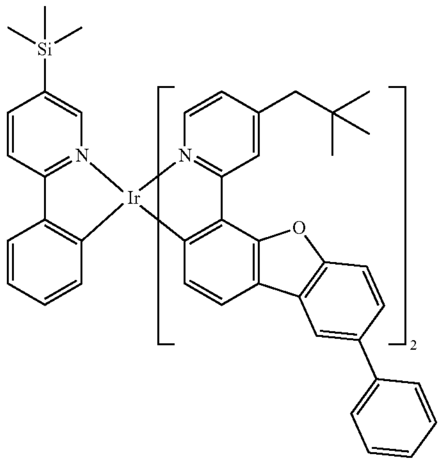
4157
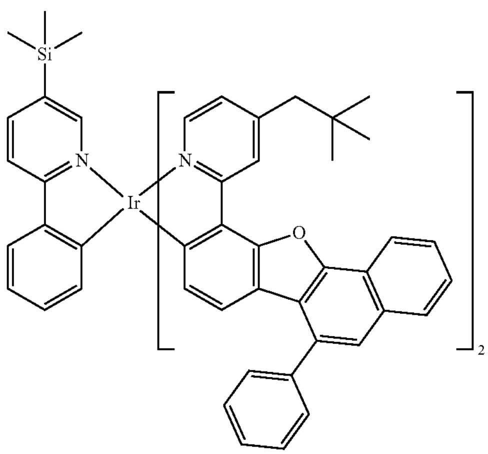
4157
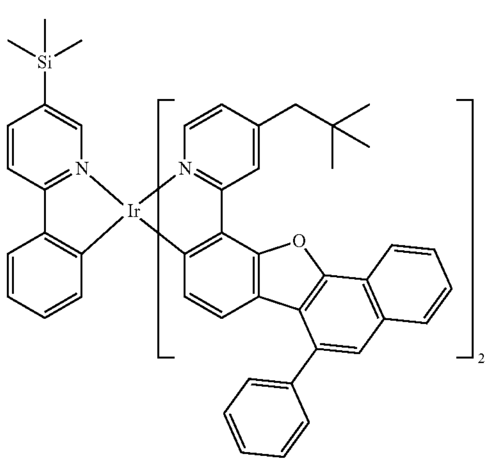
-continued
4158
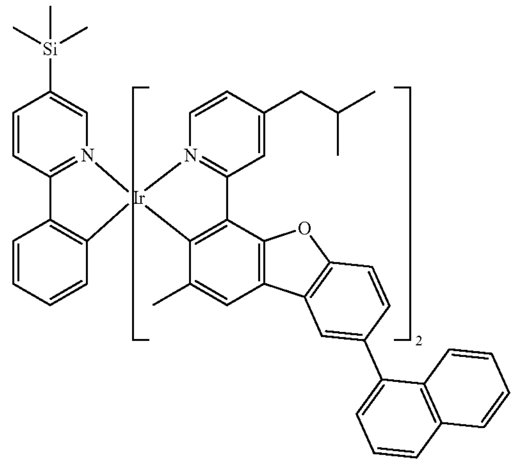
4159
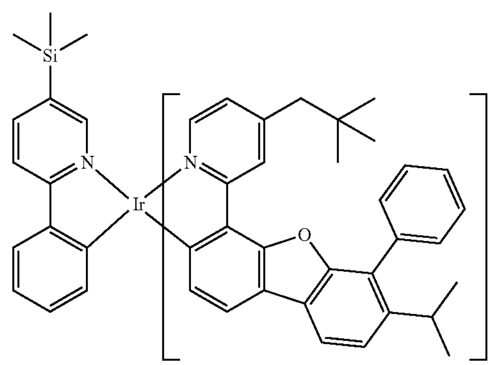
4160
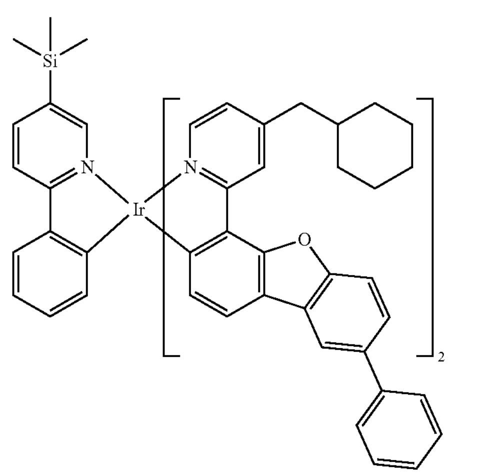

-continued
4161
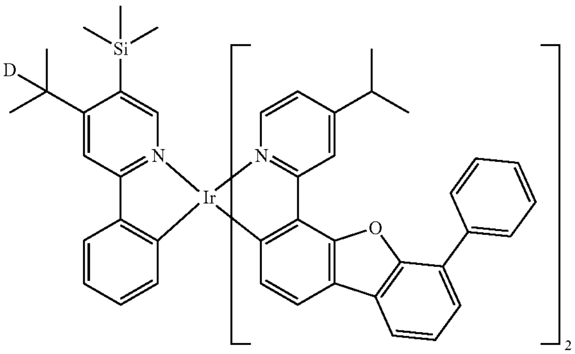
4162
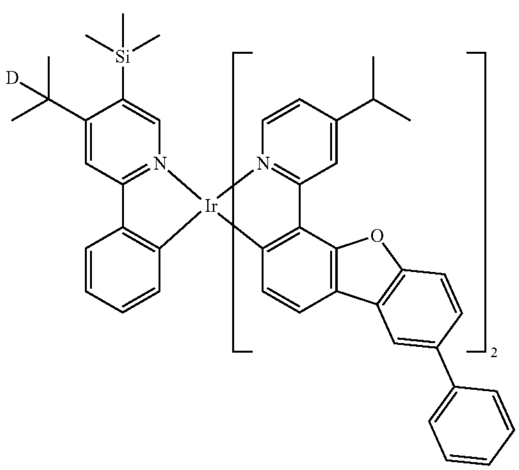
4163
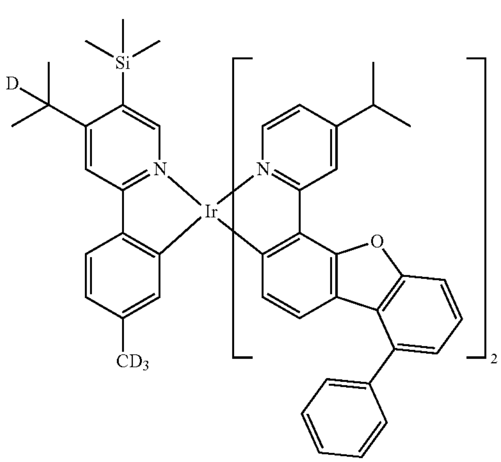
-continued
4164
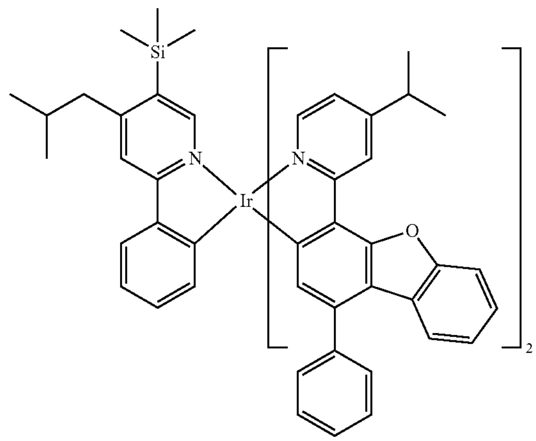
4165
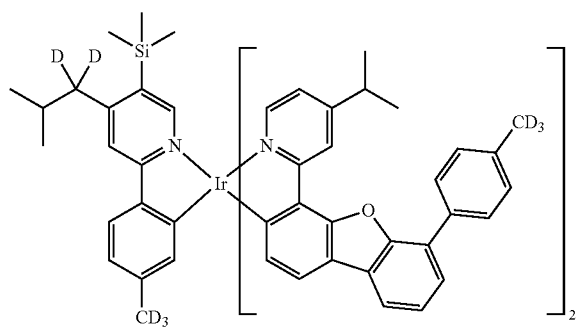
4166
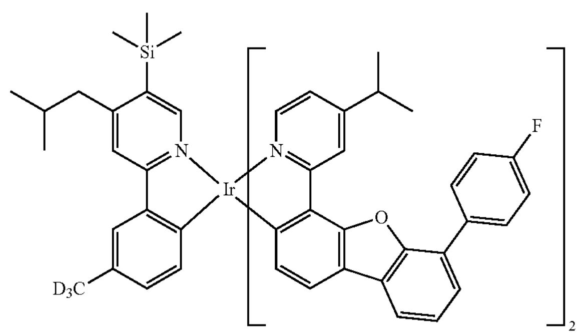
4167
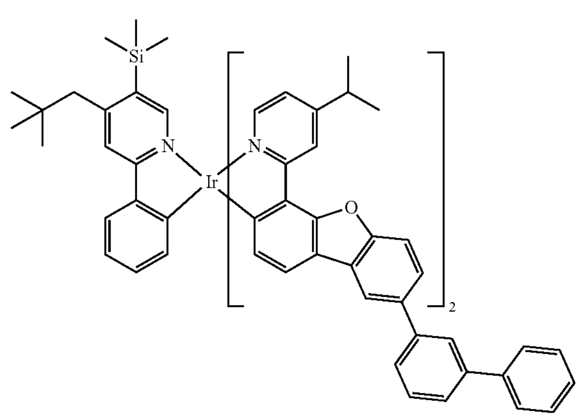

-continued
4168
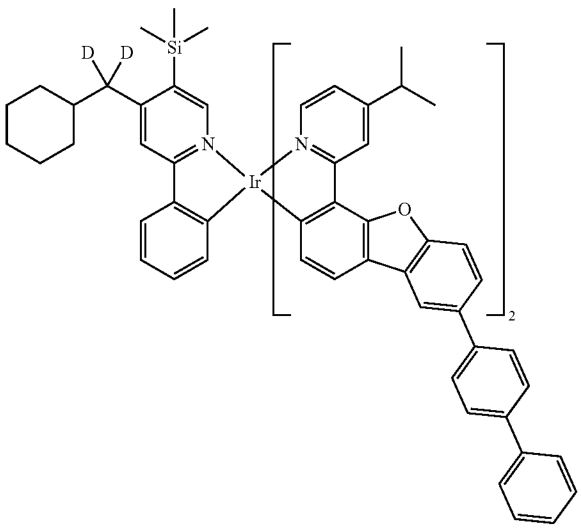
4169
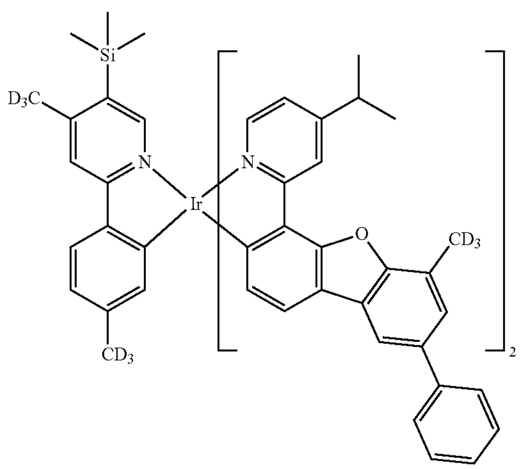
4170
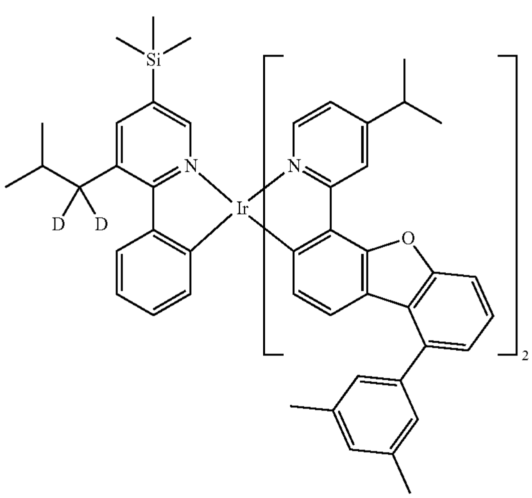
-continued
4171
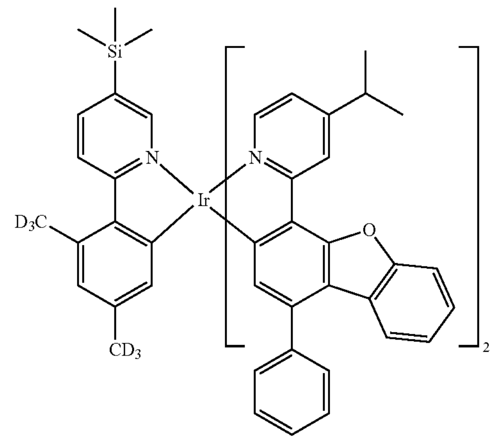
4172
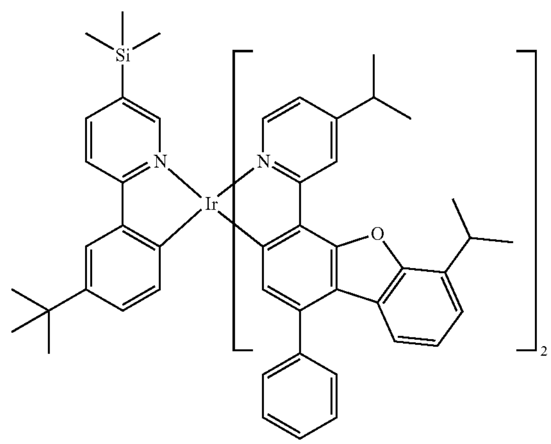
4173
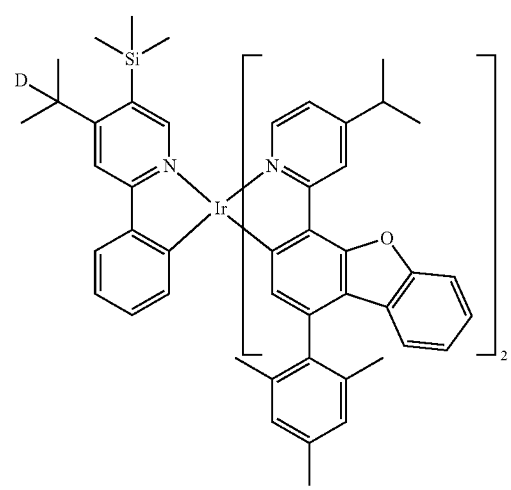

-continued
4174
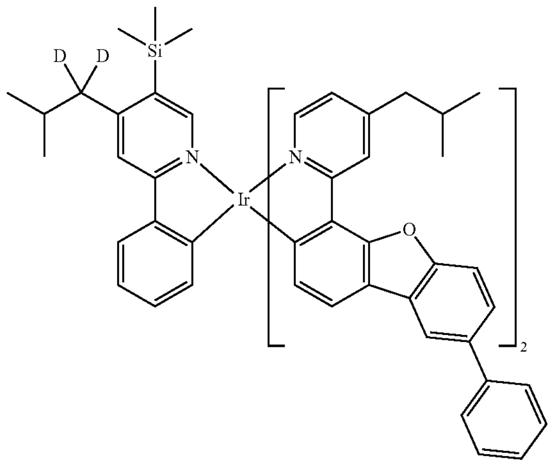
4175
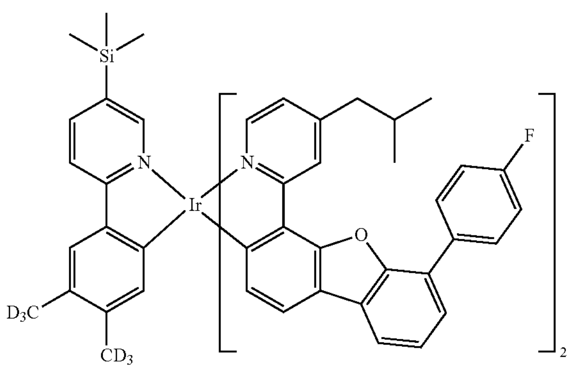
4176
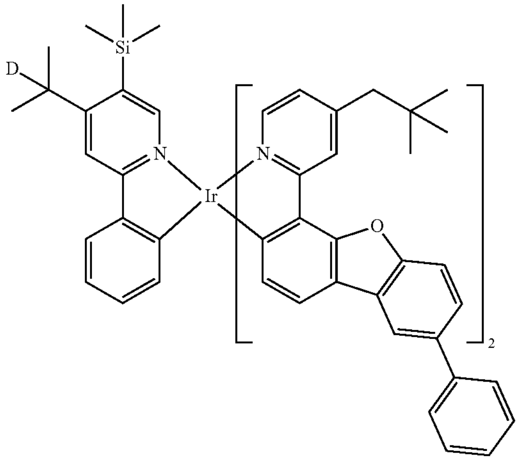
-continued
4177
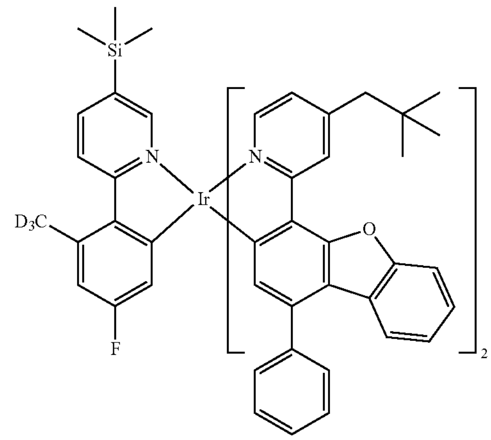
4178
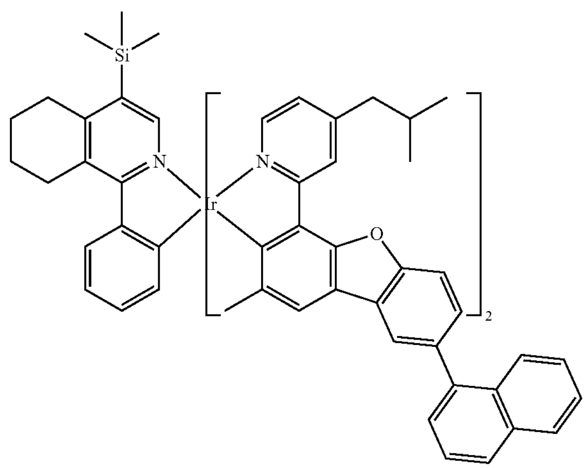
4179
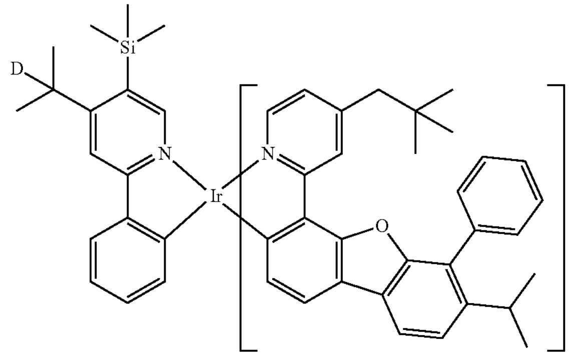

-continued
4180
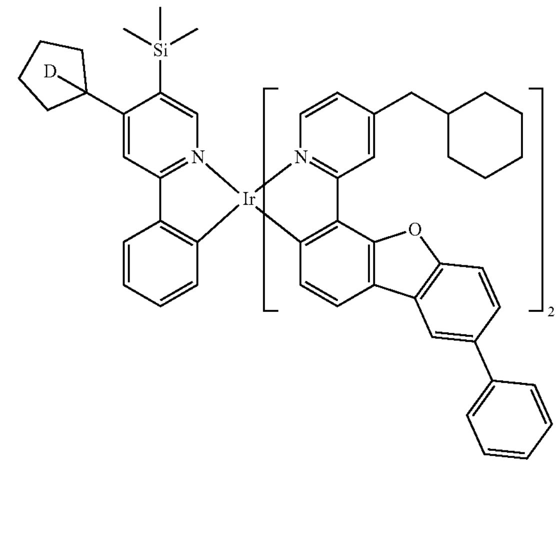
4181
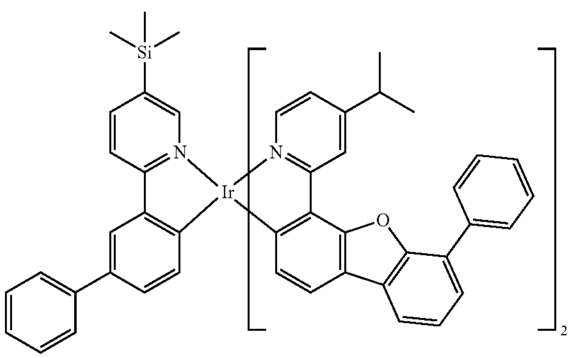
4182
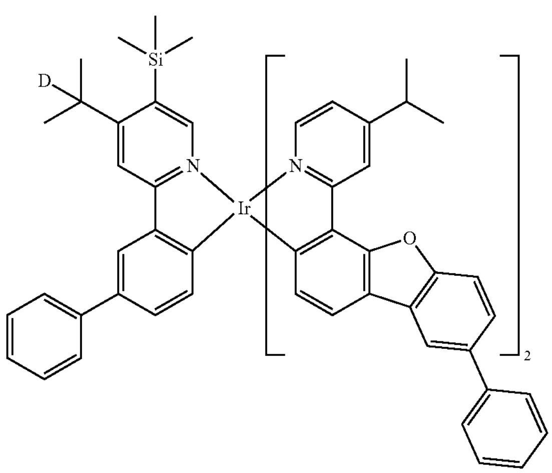
-continued
4183
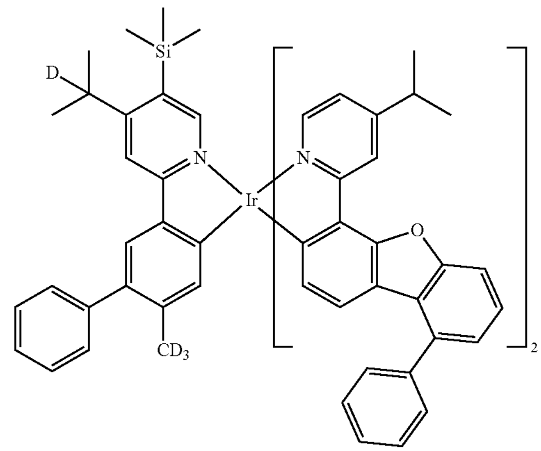
4184
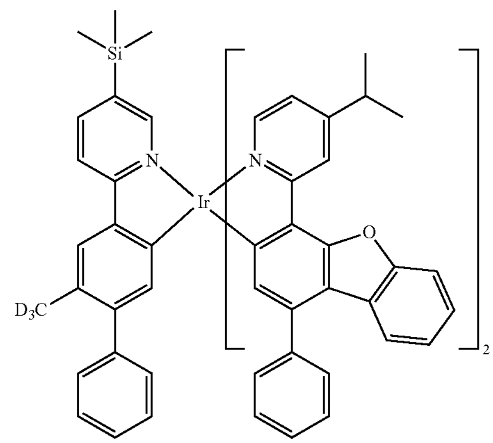
4185
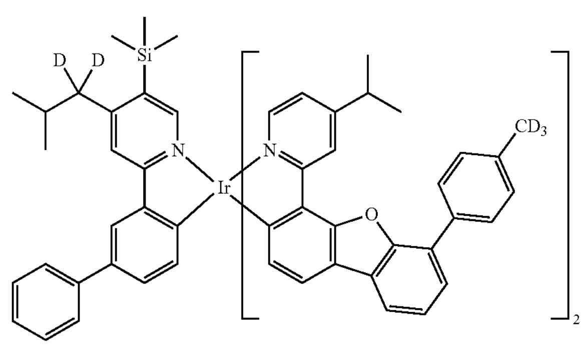
4186
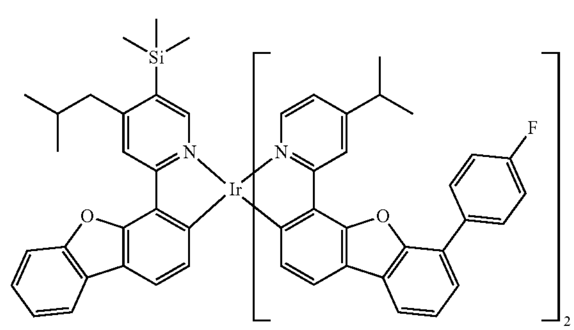

-continued
4187
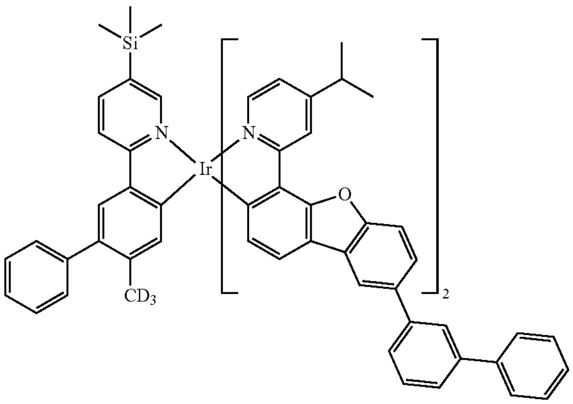
4188
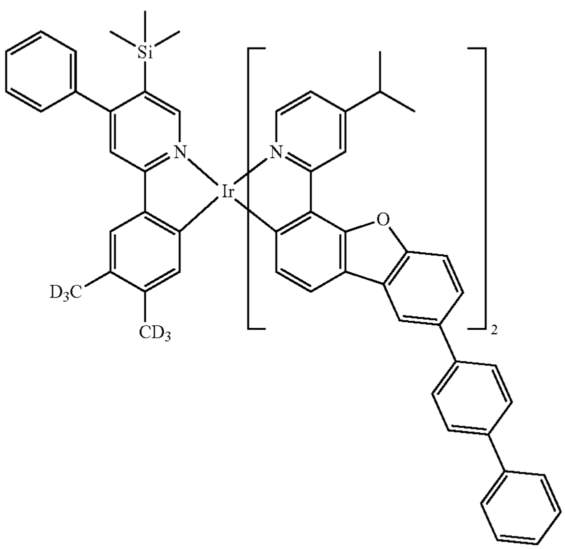
4189
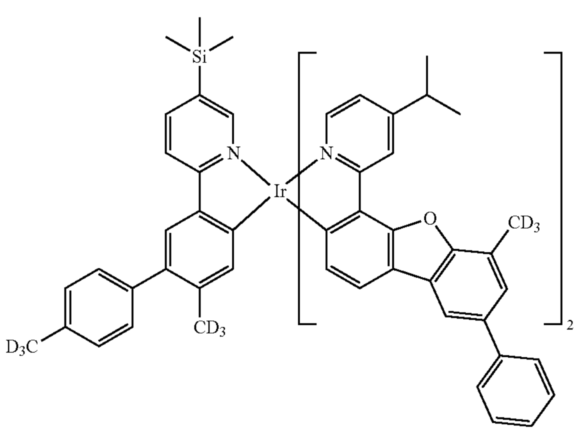
-continued
4190
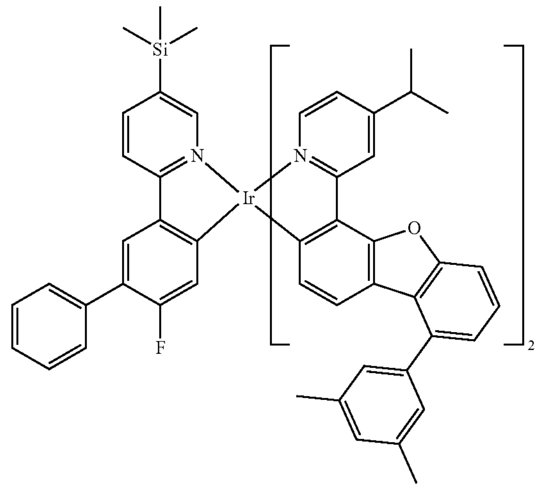
4191
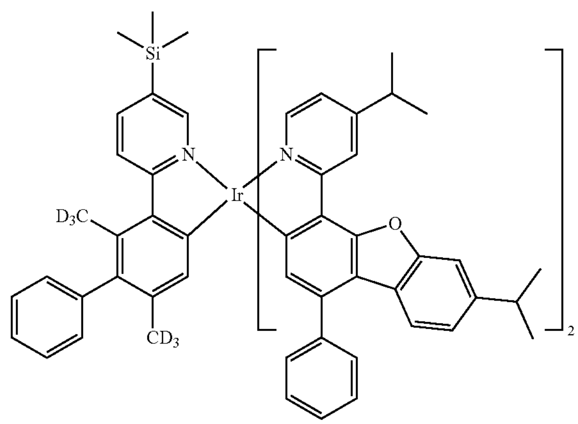
4192
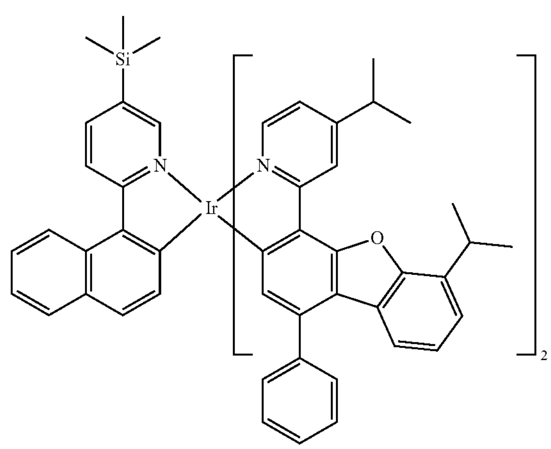

-continued
4193
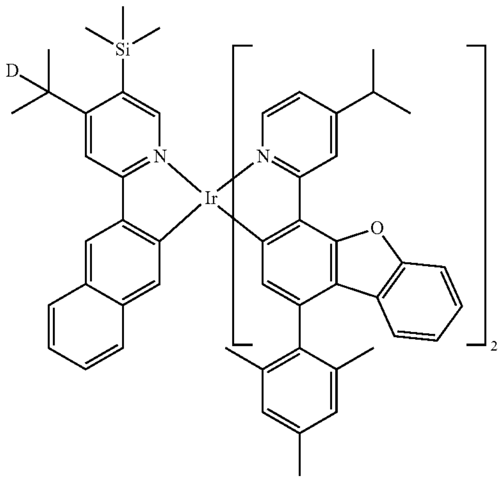
4194
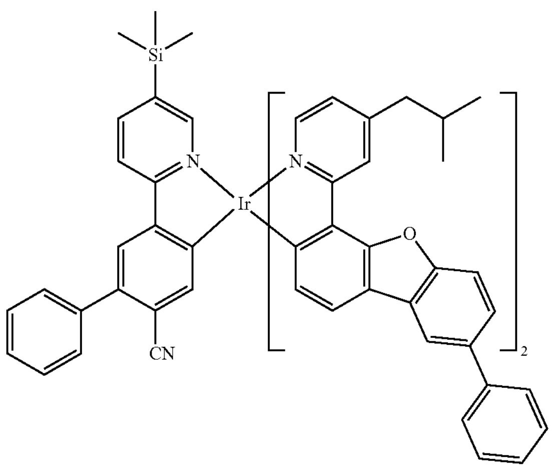
4195
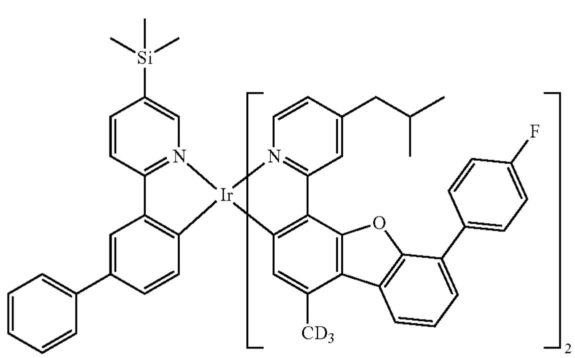
-continued
4196
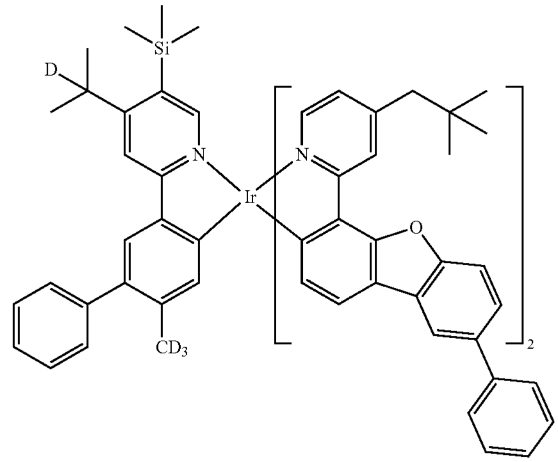
4197
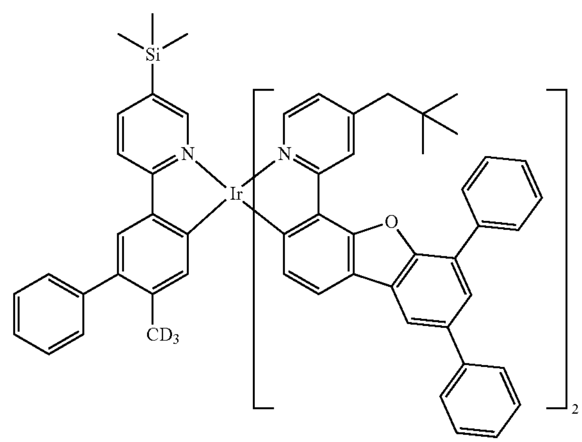
4198
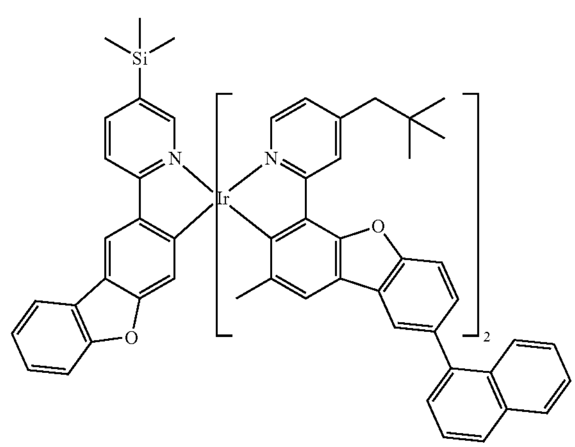

-continued
4199
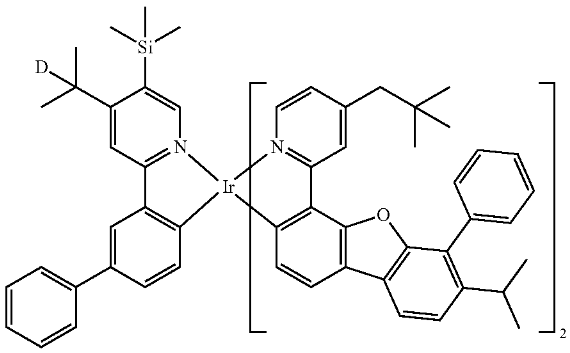
4200
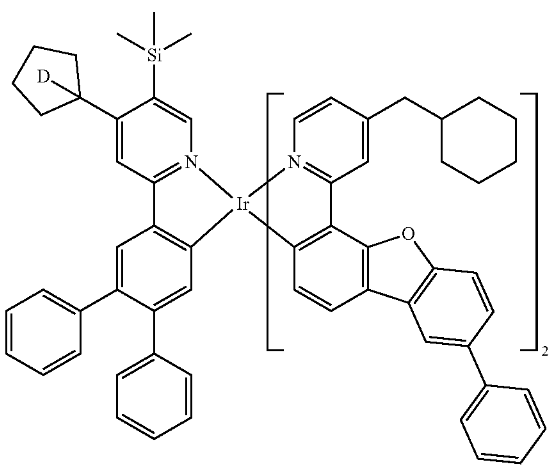
4201
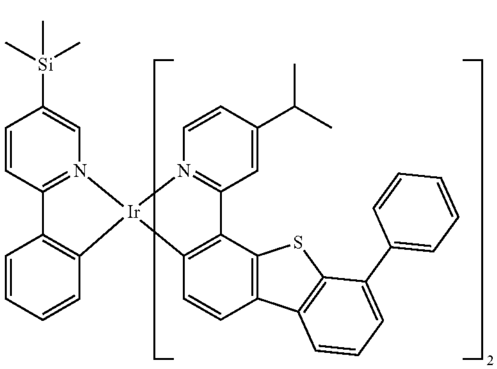
-continued
4202
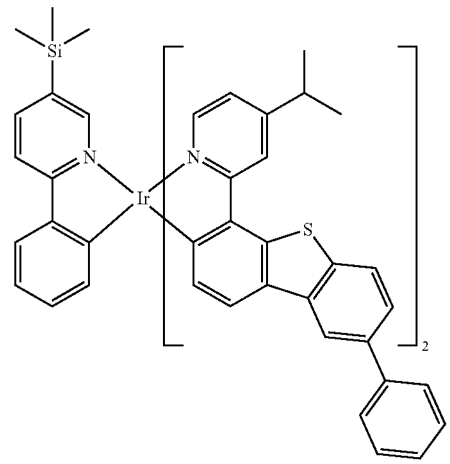
4203
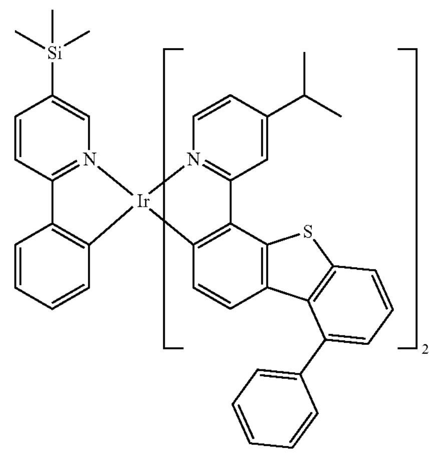
4204
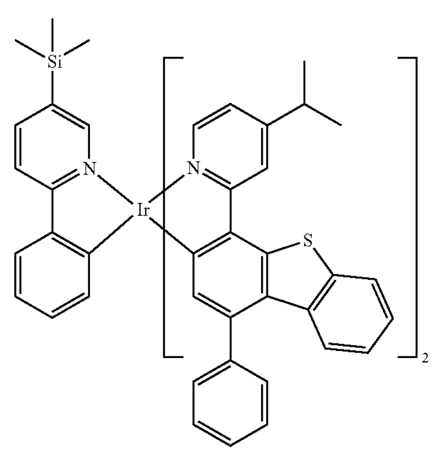

-continued
4205
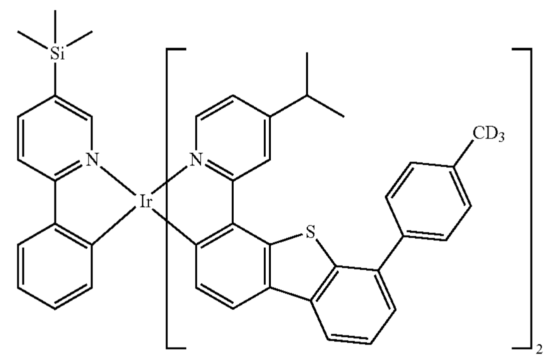
4206
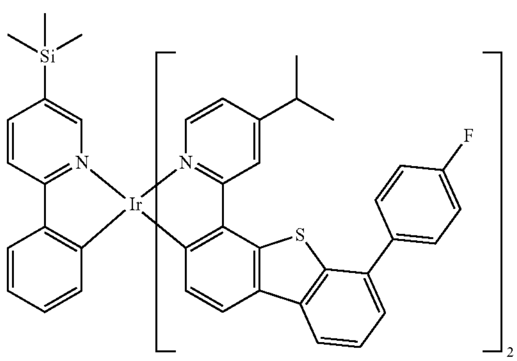
4207
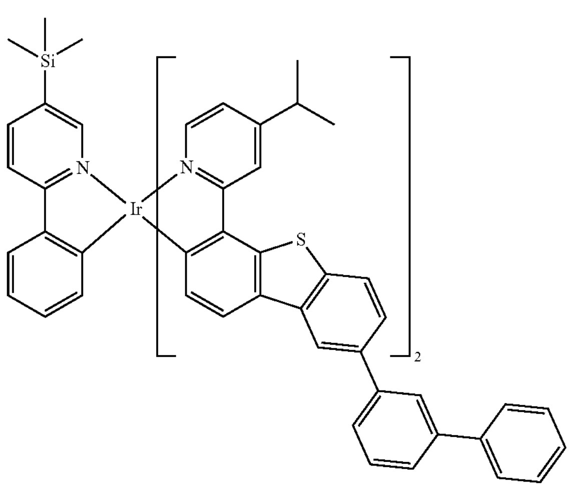
-continued
4208
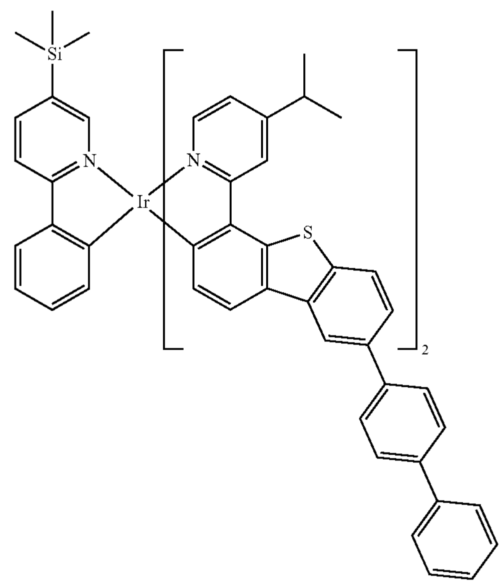
4209
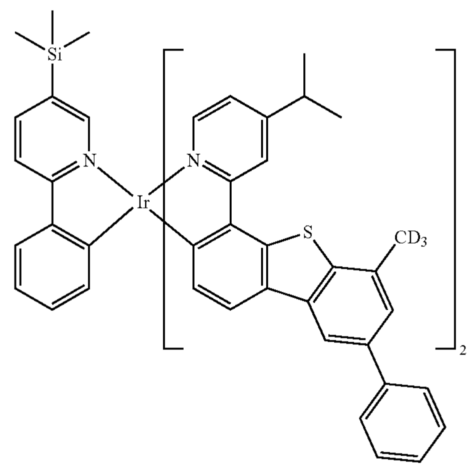
4210
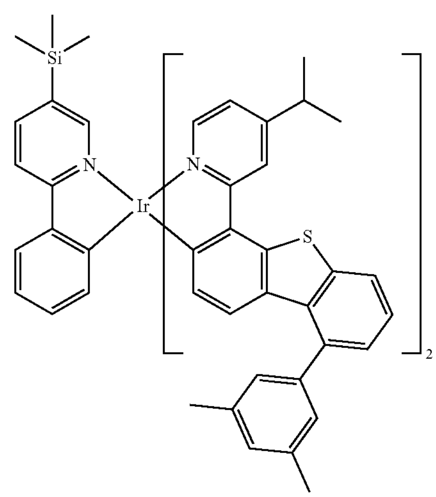

-continued
4211
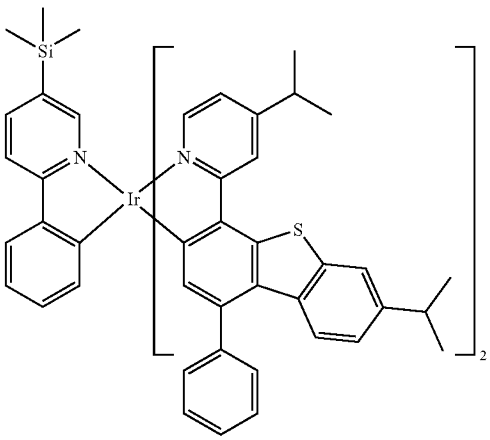
4212
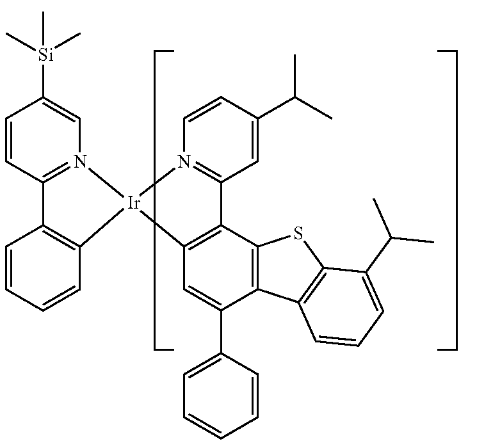
4213
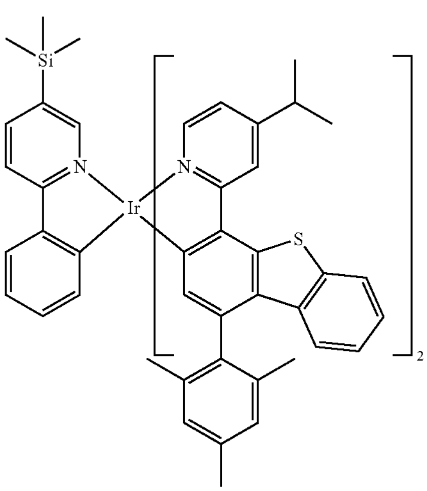
-continued
4214
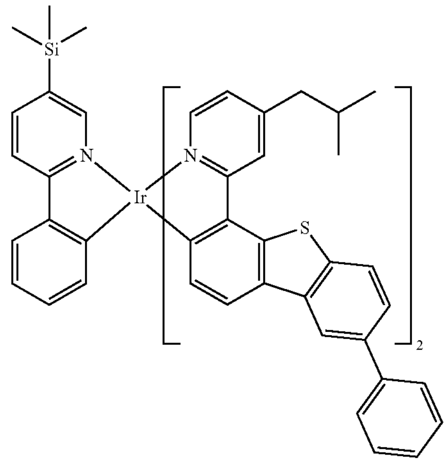
4215
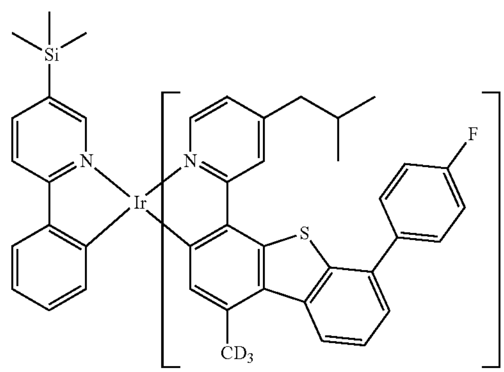
4216
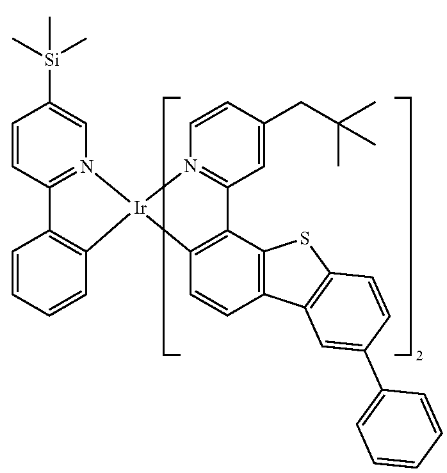

4217
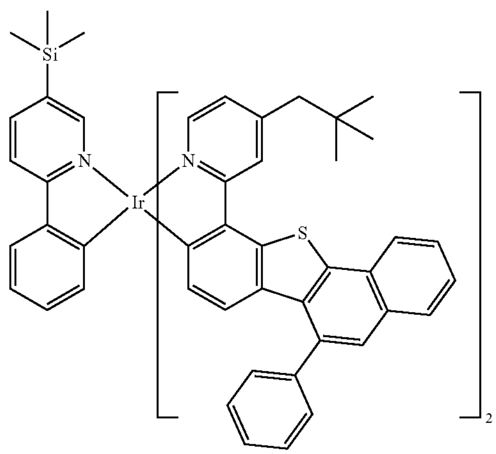
4218
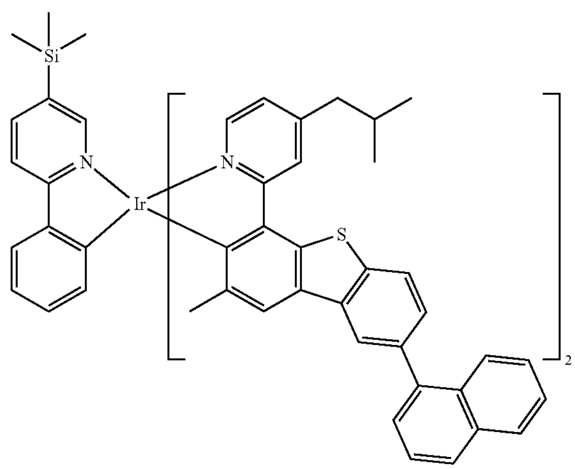
4219
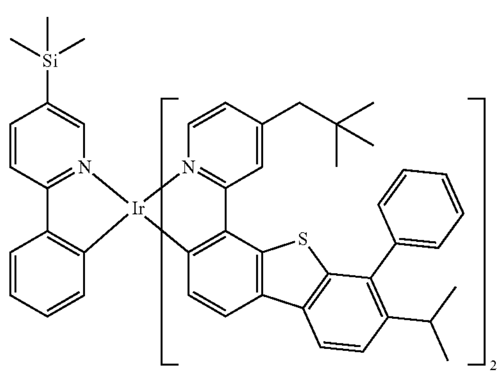
4220
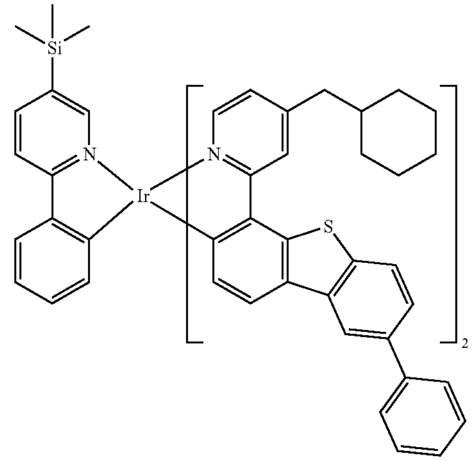
4221
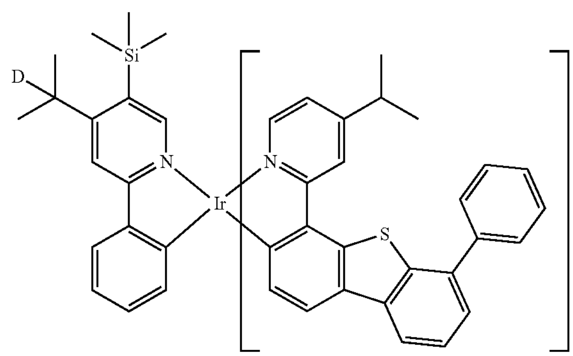
4222
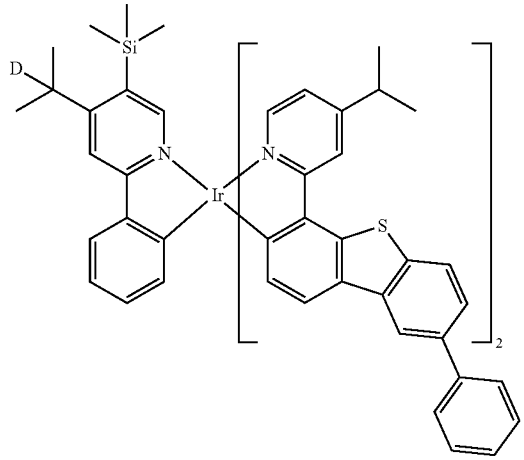

4223
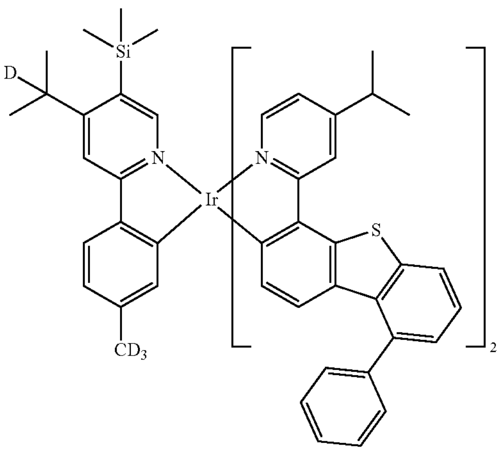
4224
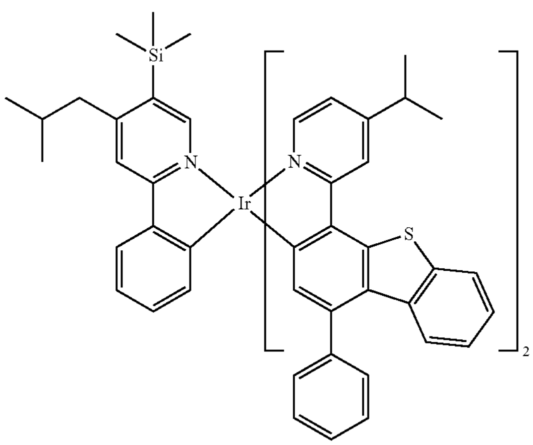
4225
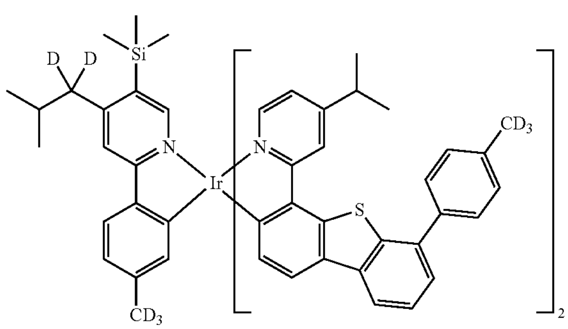
4226
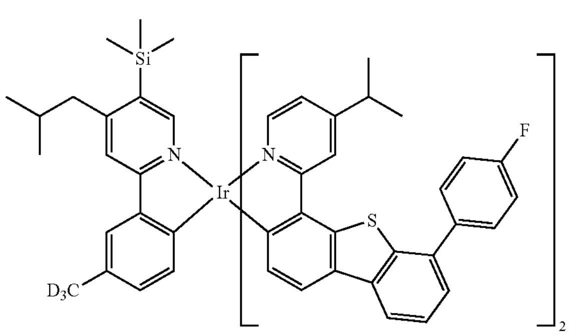
4227
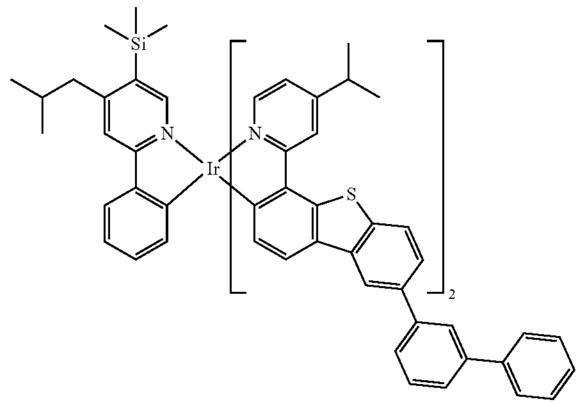
4228
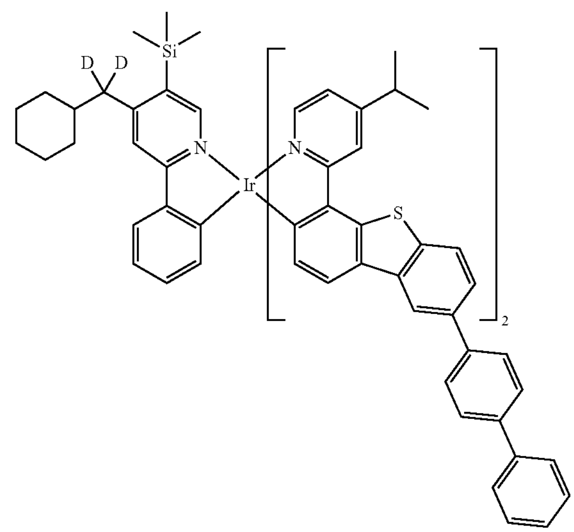
4229
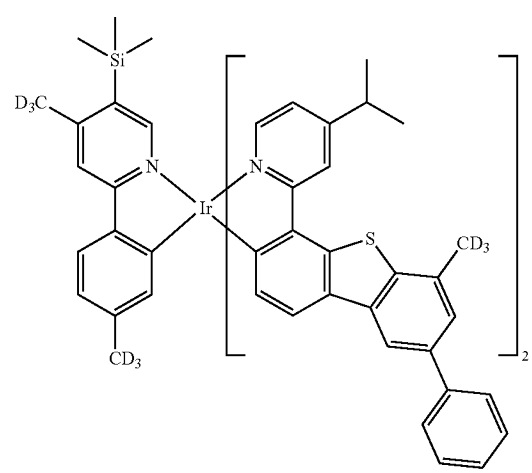

-continued
4230
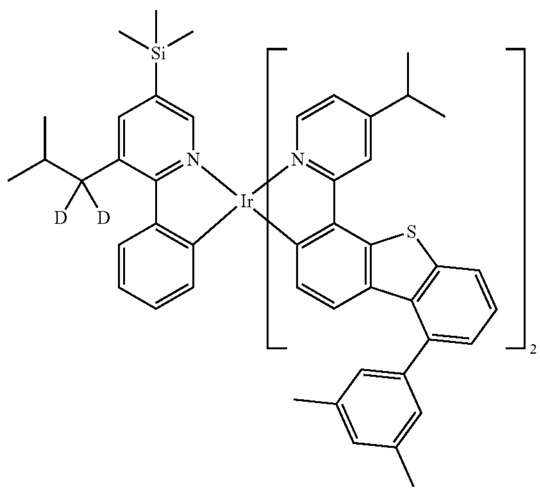
4231
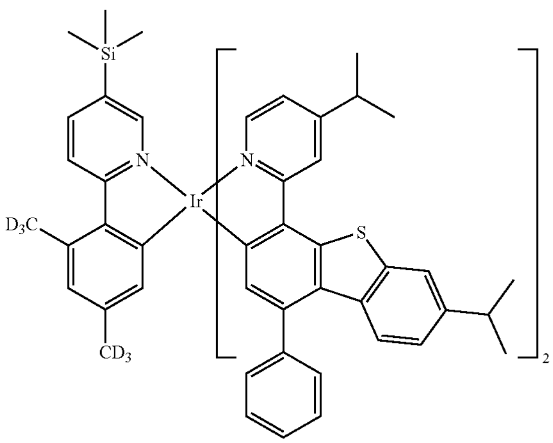
4232
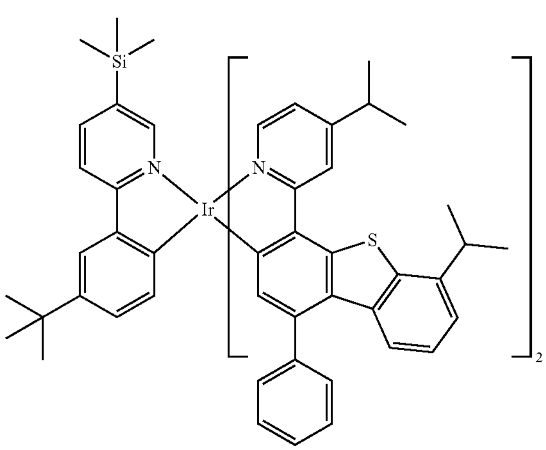
-continued
4233
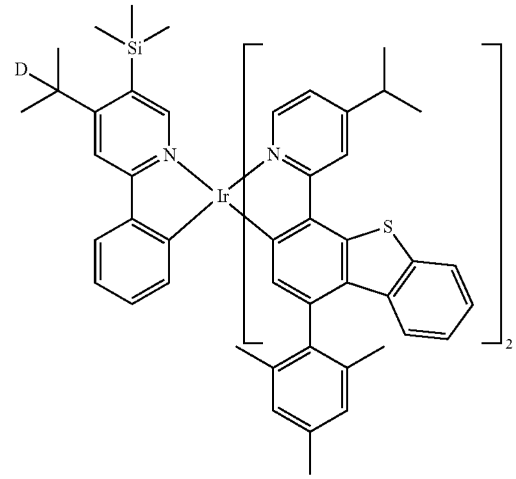
4234
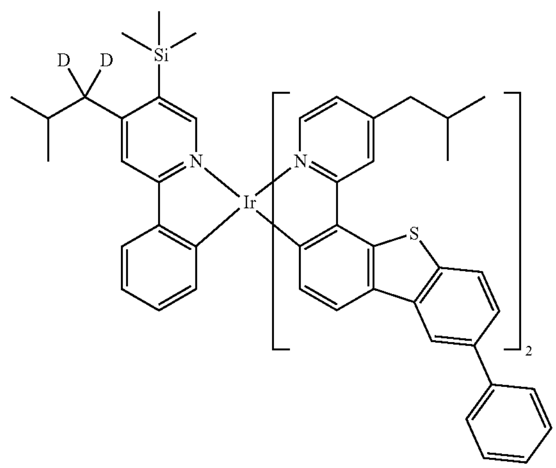
4235
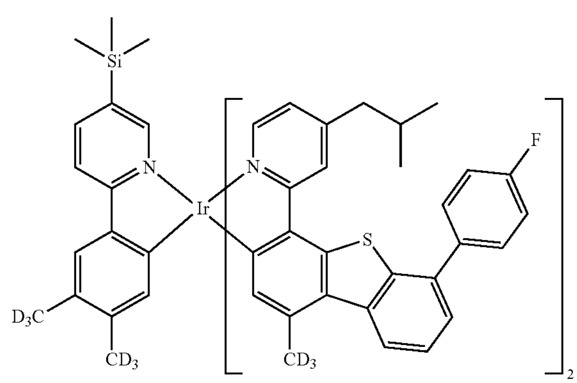

-continued
4236
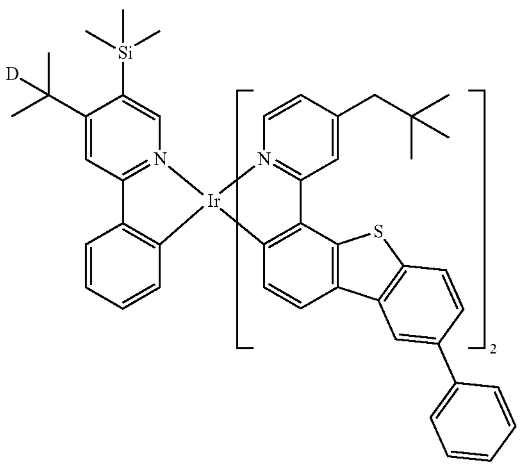
4237
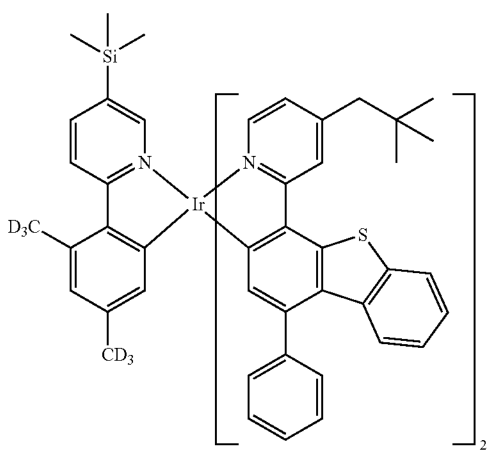
4238
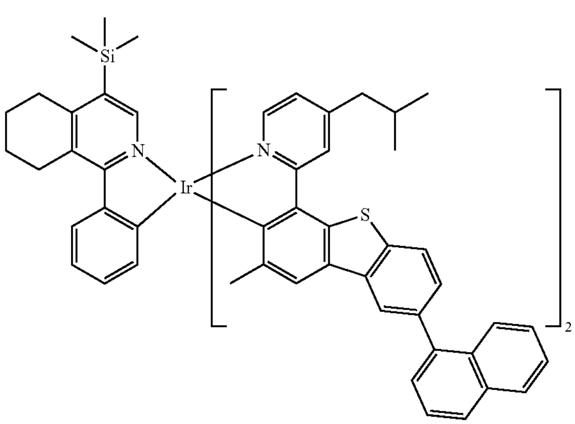
-continued
4239
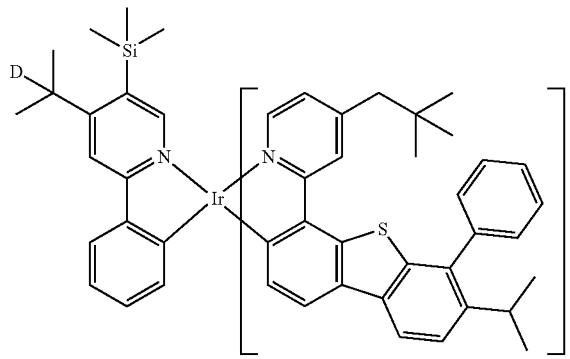
4240
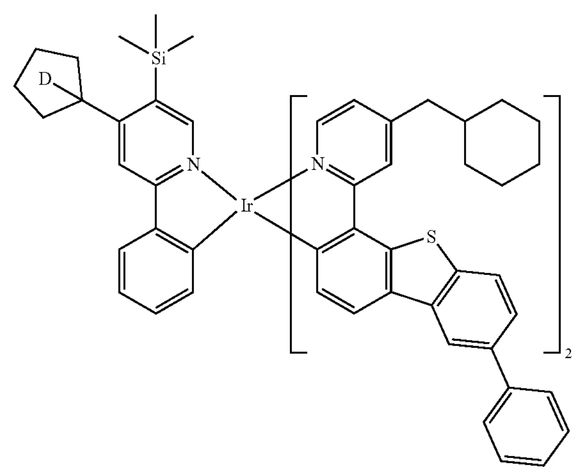
4241
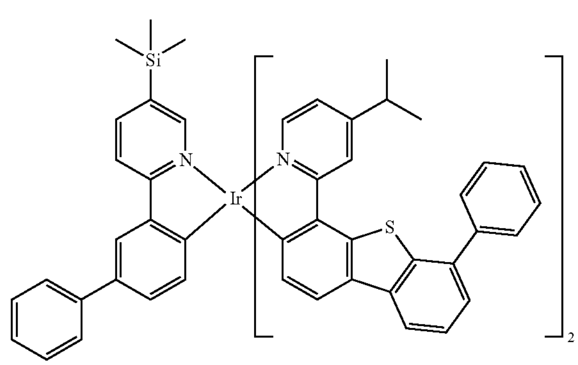

-continued
4242
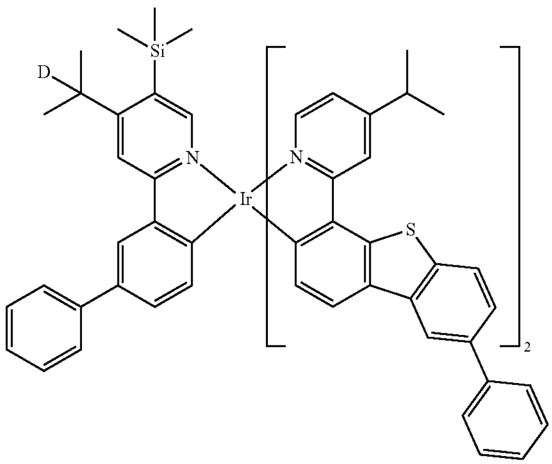
4243
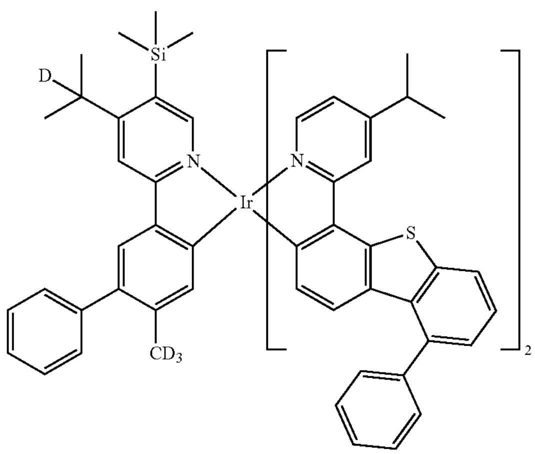
4244
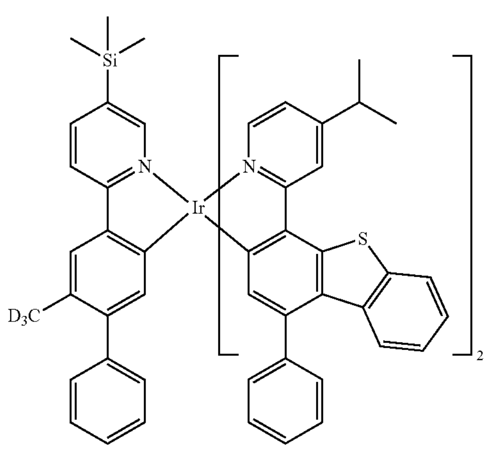
-continued
4245
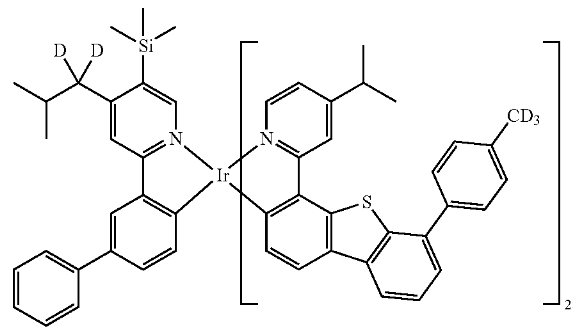
4246
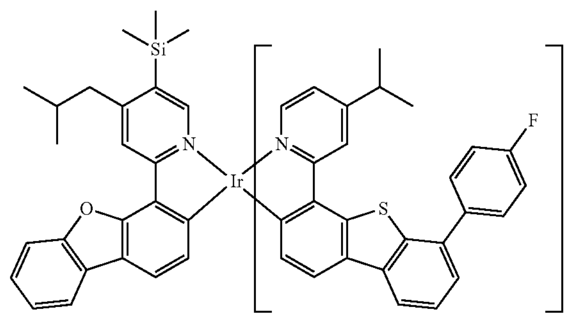
4247
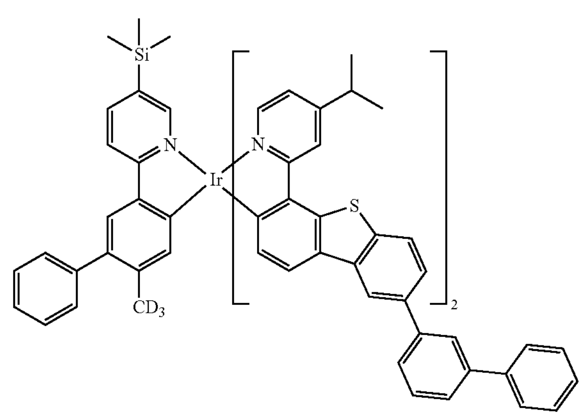

-continued
4248
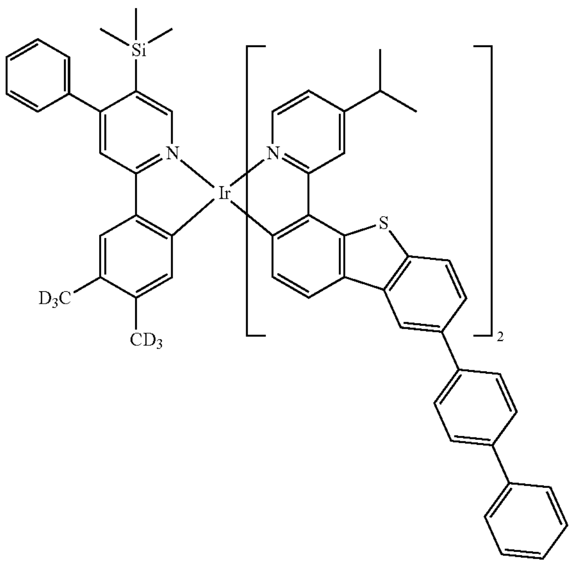
4249
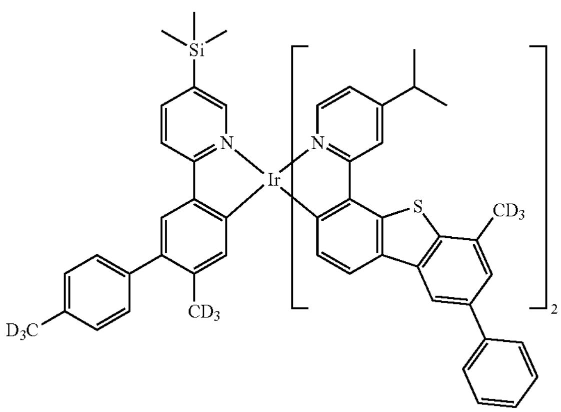
4250
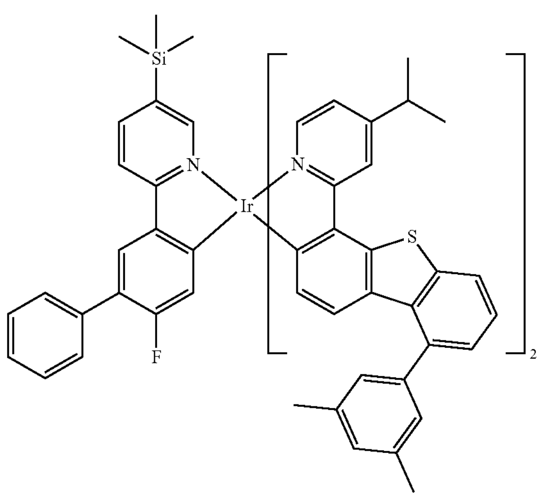
-continued
4251
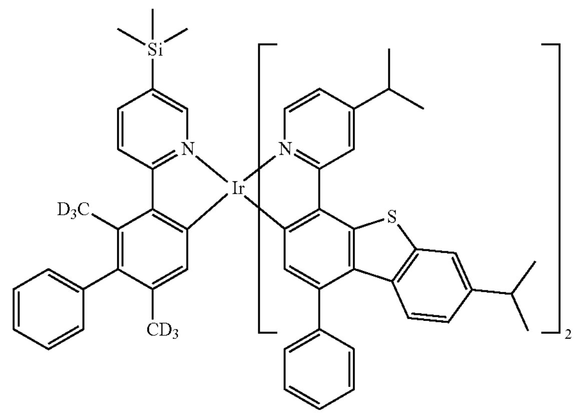
4252
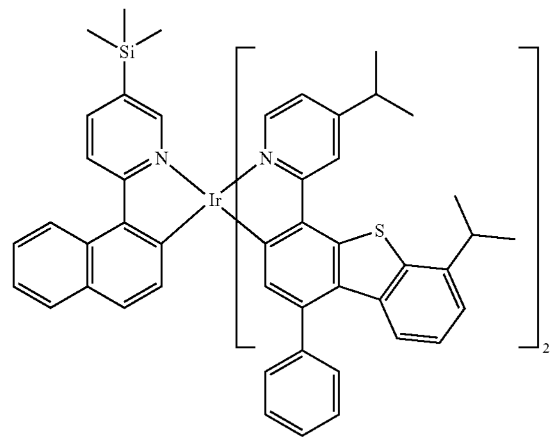
4253
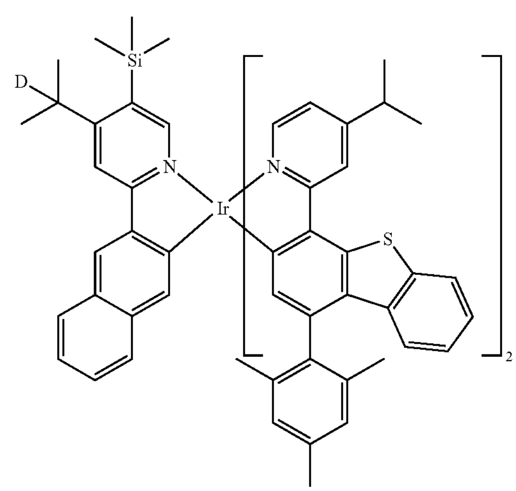

4254
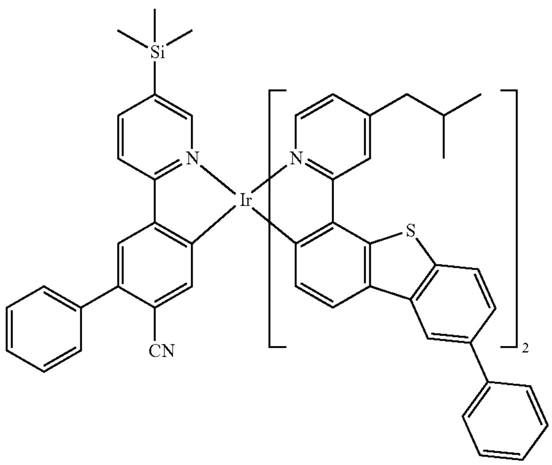
4255
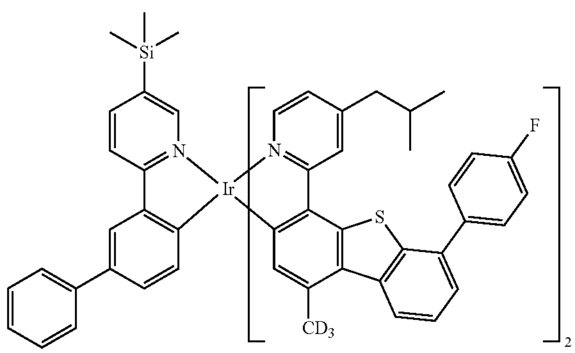
4256
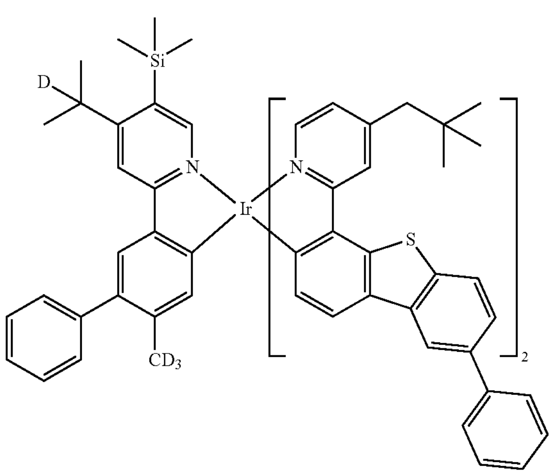
4257
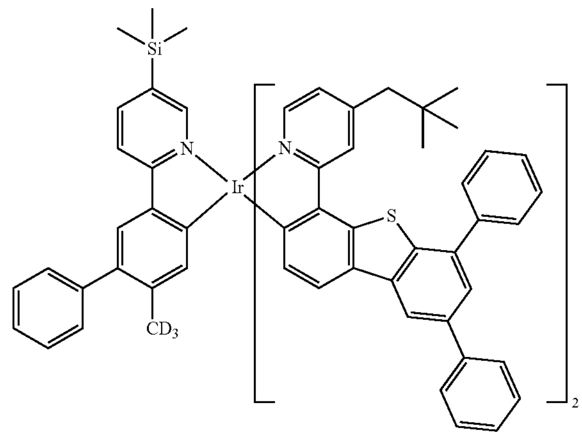
4258
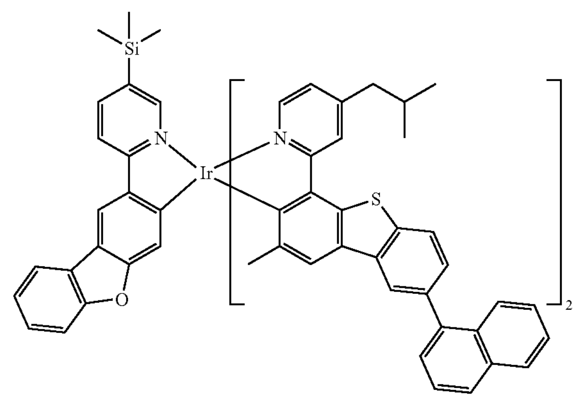
4259
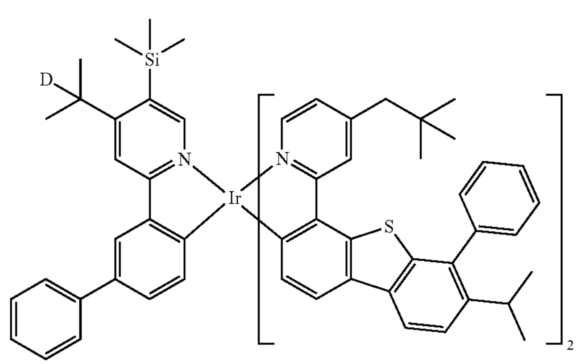

-continued
4260
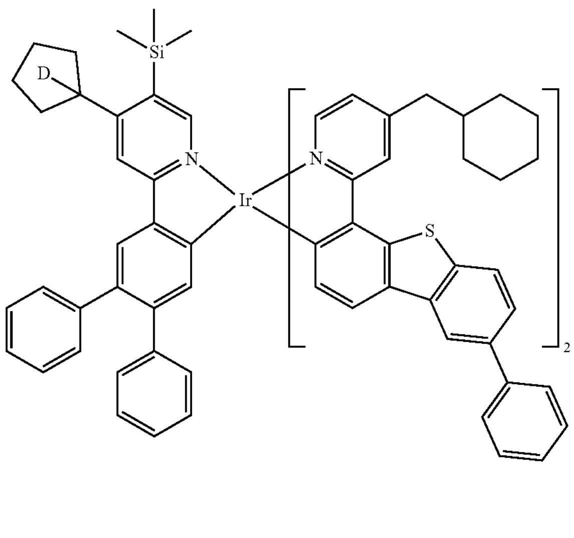
4261
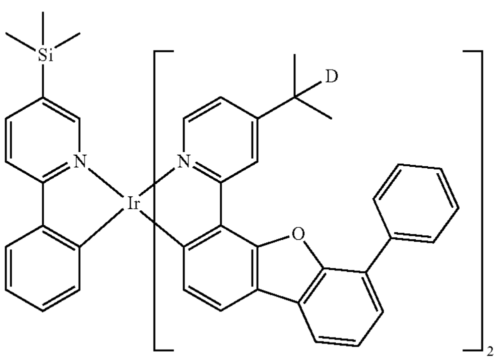
4262
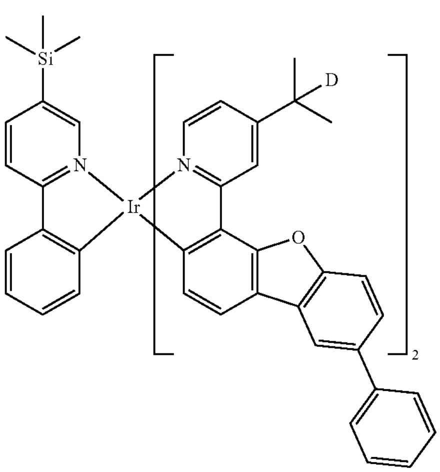
-continued
4263
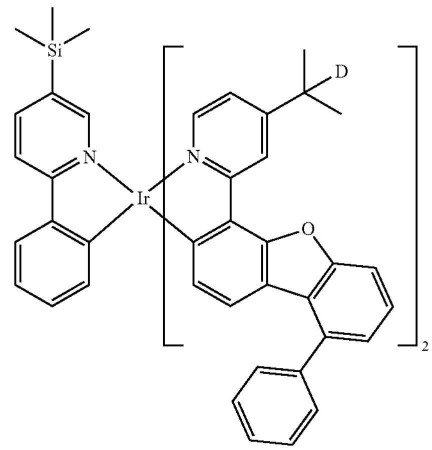
4264
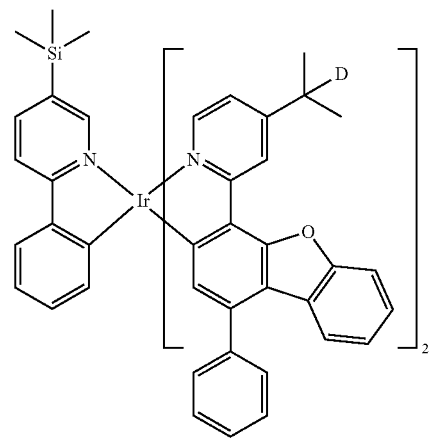
4265
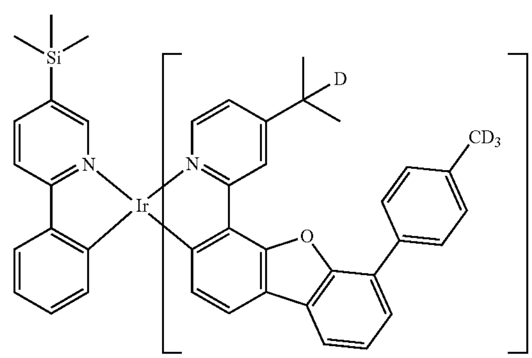
4266
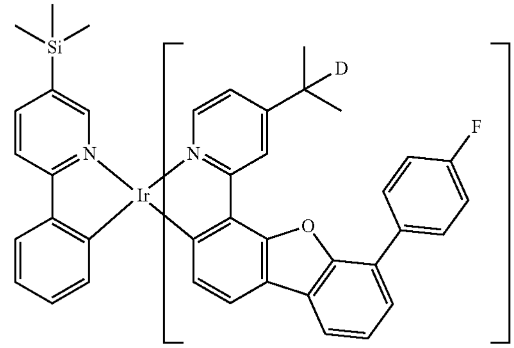

-continued
4267
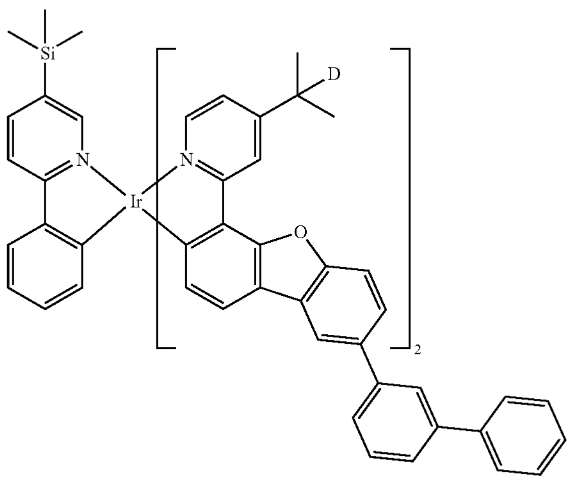
4268
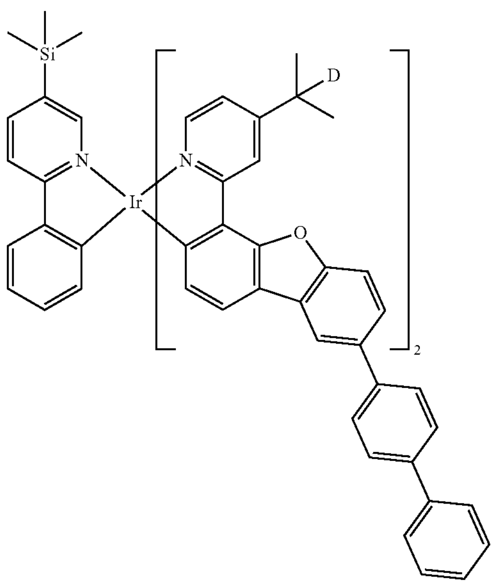
4269
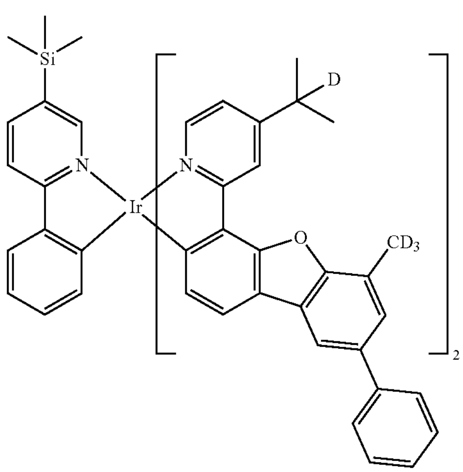
-continued
4270
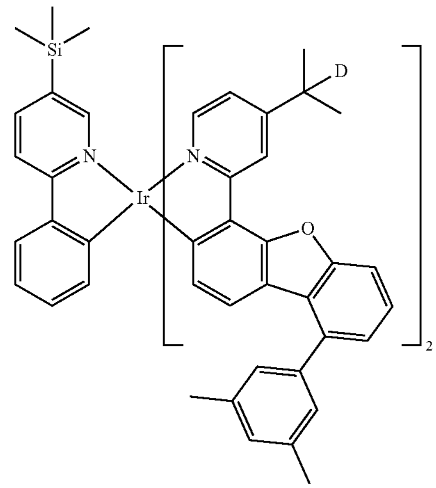
4271
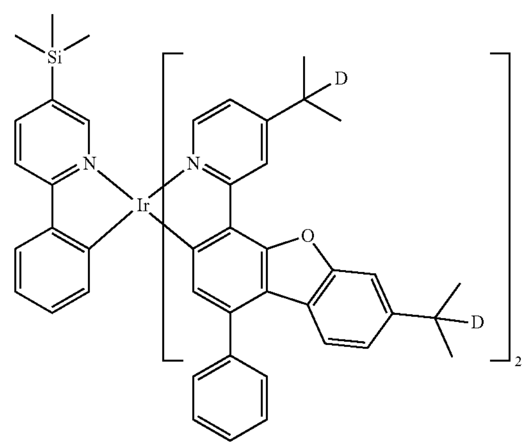
4272
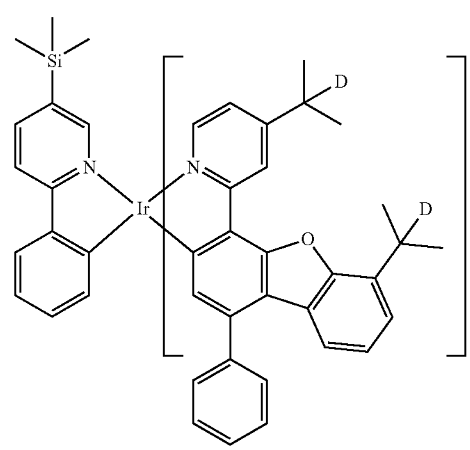

4273
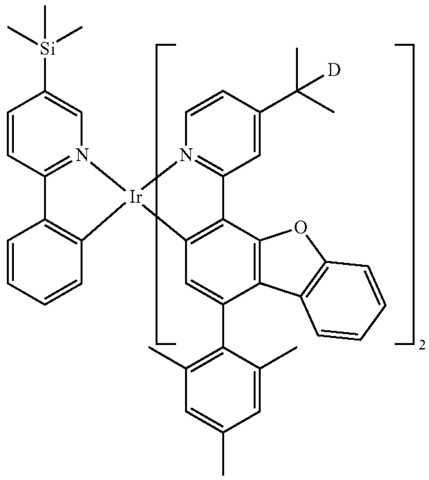
4274
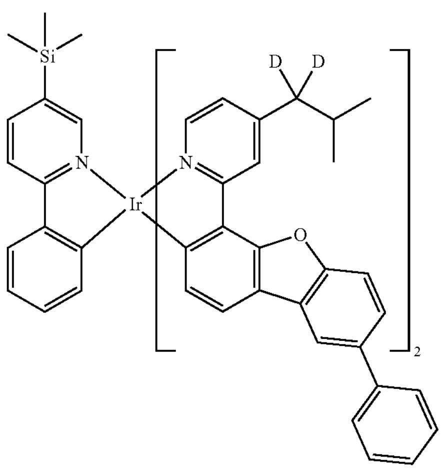
4275
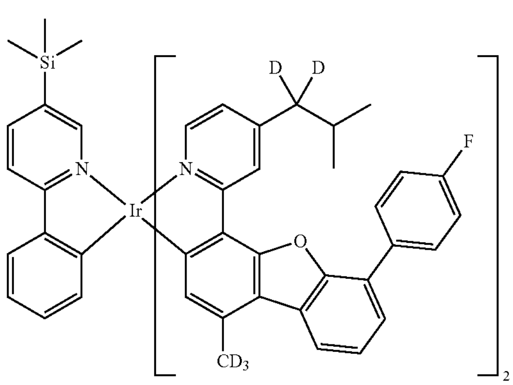
4276
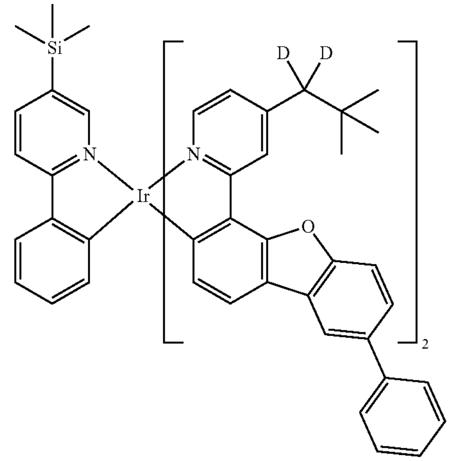
4277
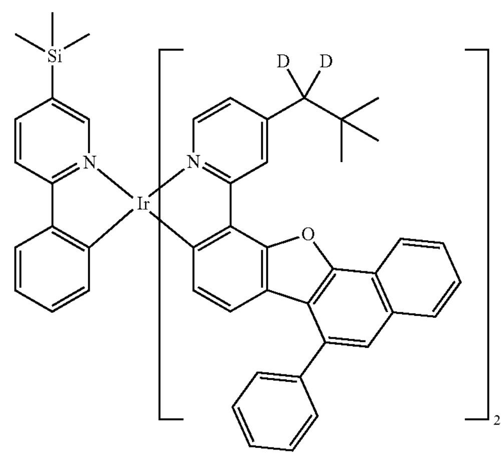
4278
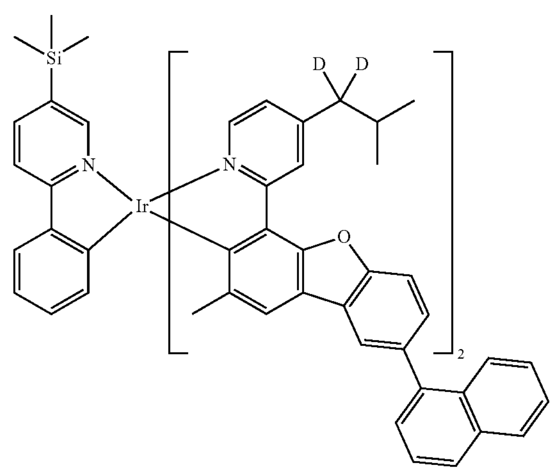

-continued
4279
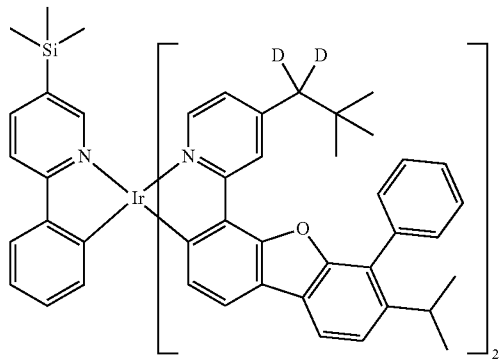
4280
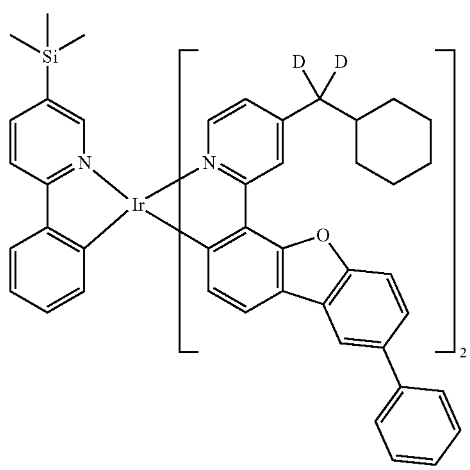
4281
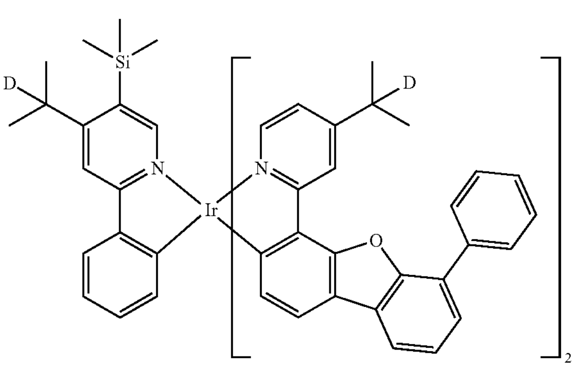
-continued
4282
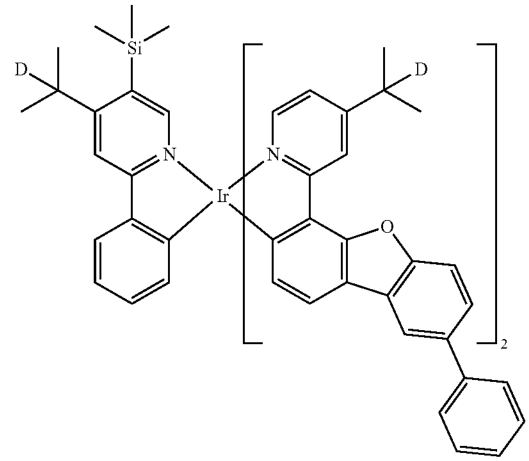
4283
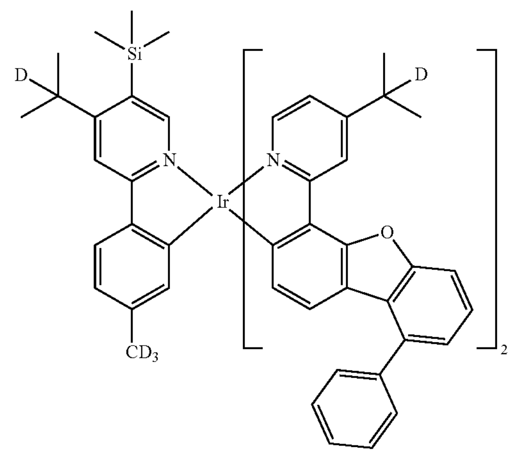
4284
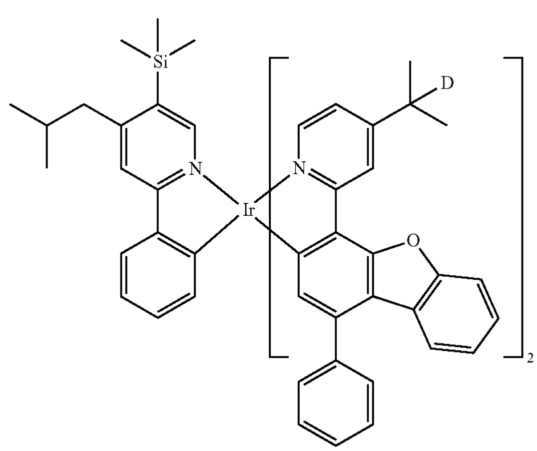

-continued
4285
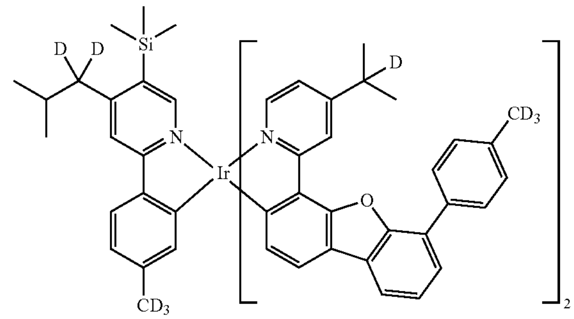
4286
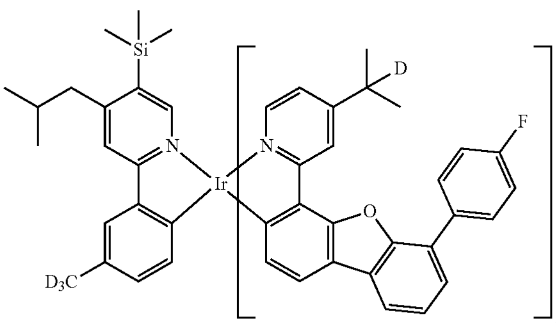
4287
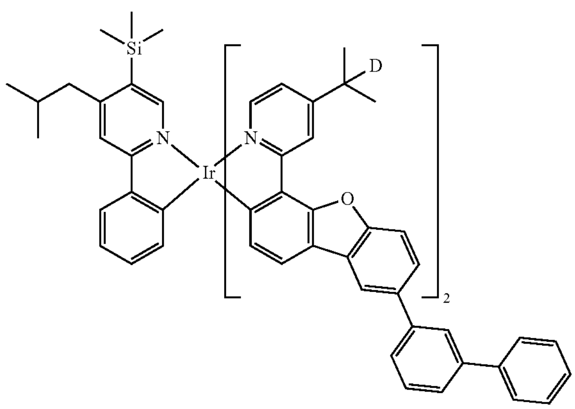
4288
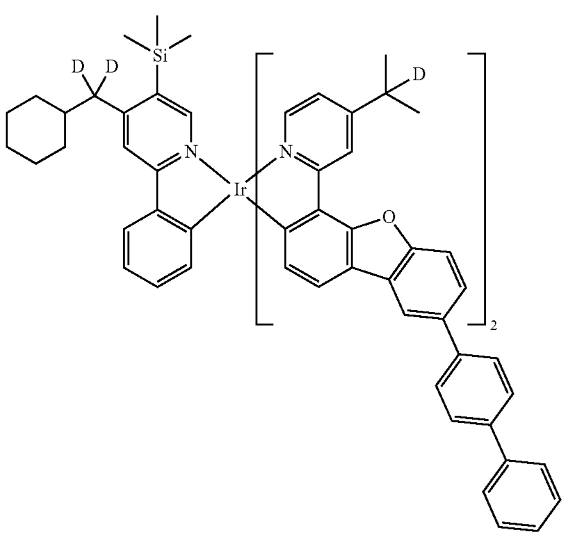
-continued
4289
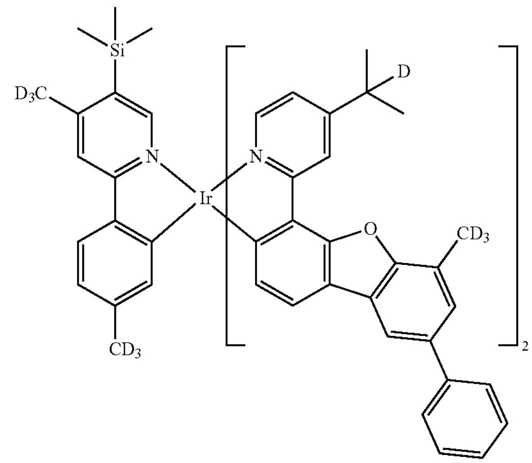
4290
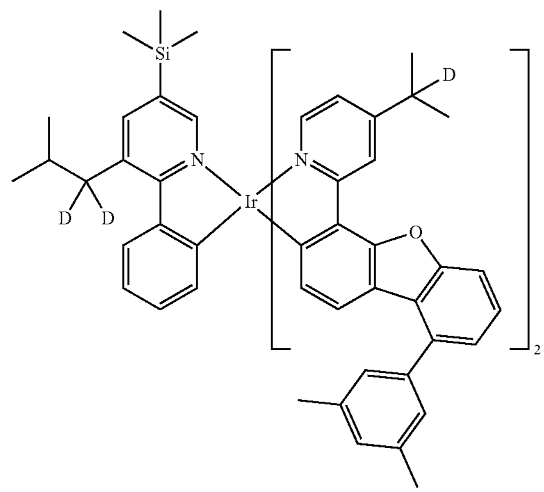
4291
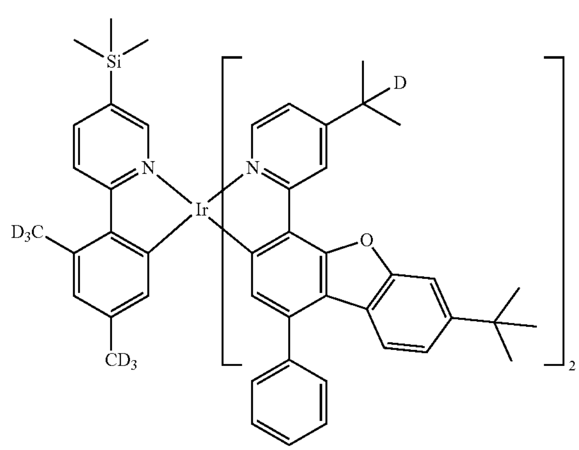

-continued
4292
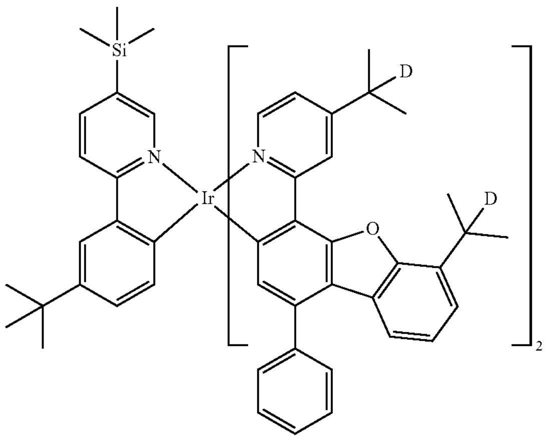
4293
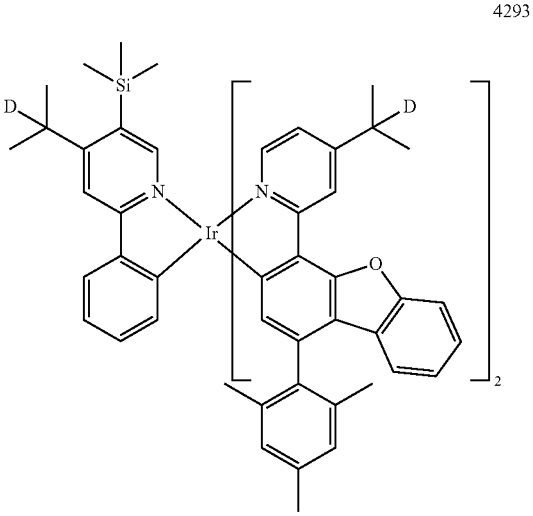
4294
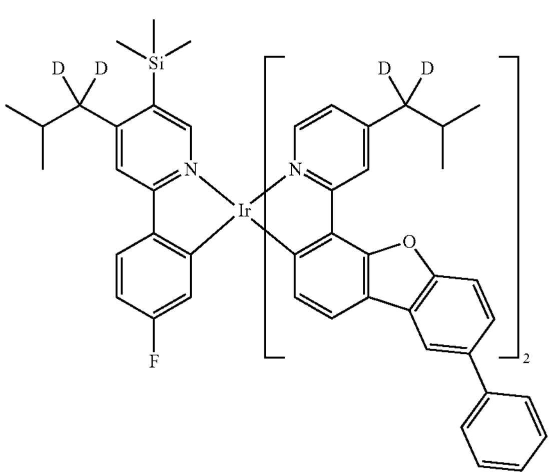
-continued
4295
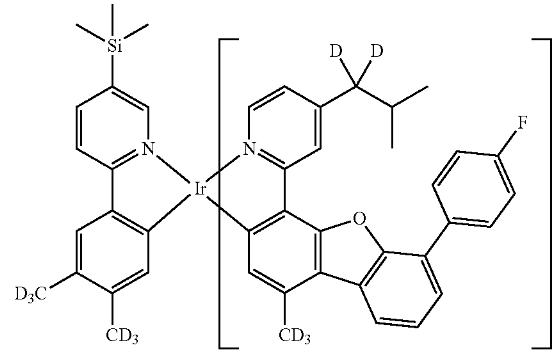
4296
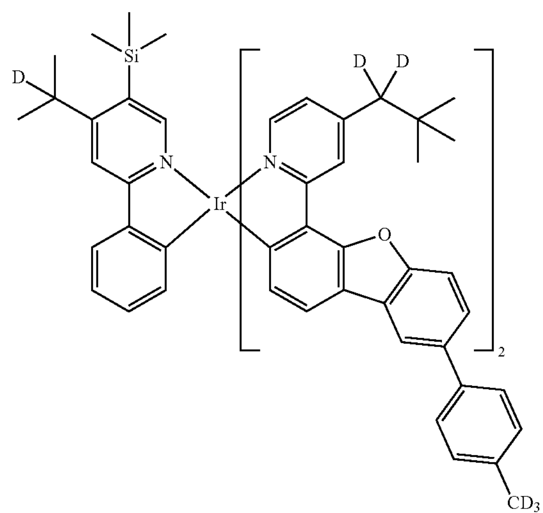
4297
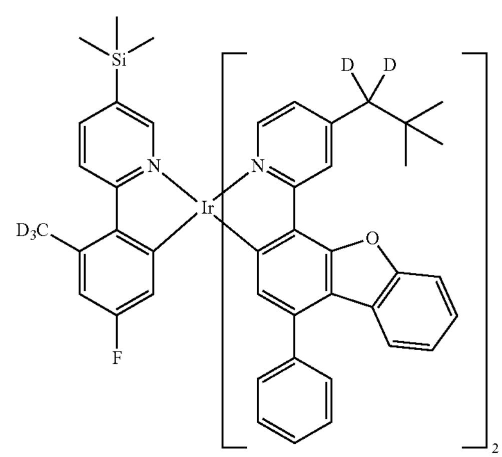

4298
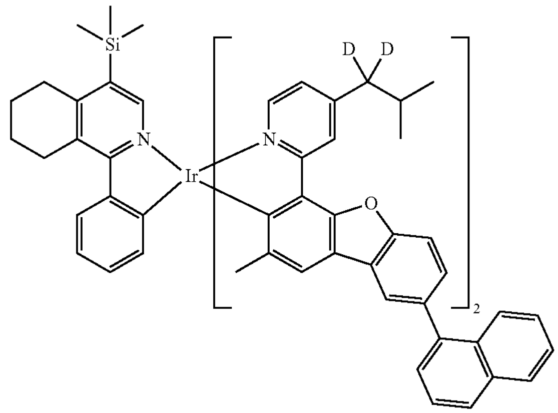
4299
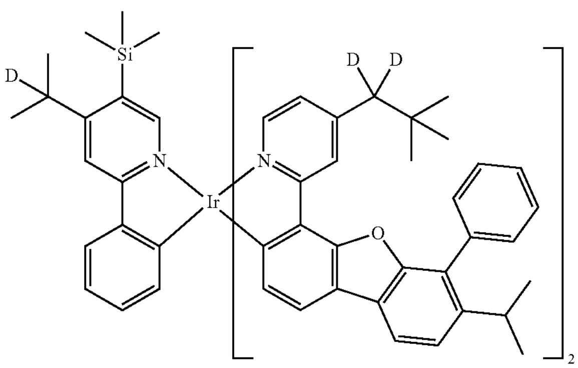
4300
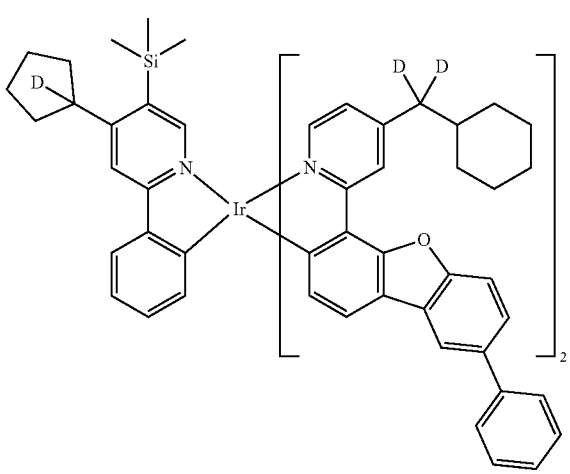
4301
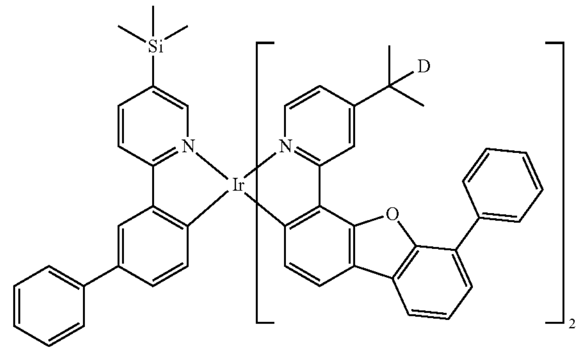
4302
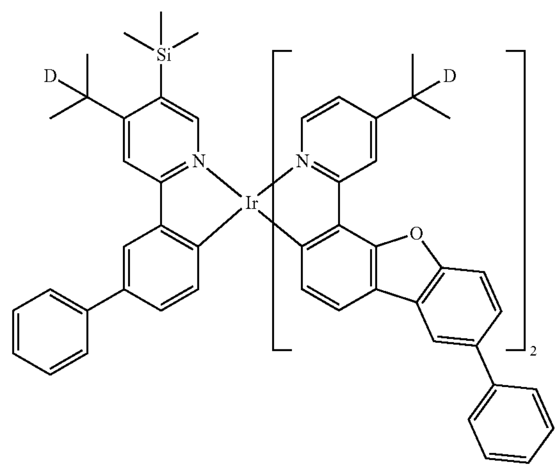
4303
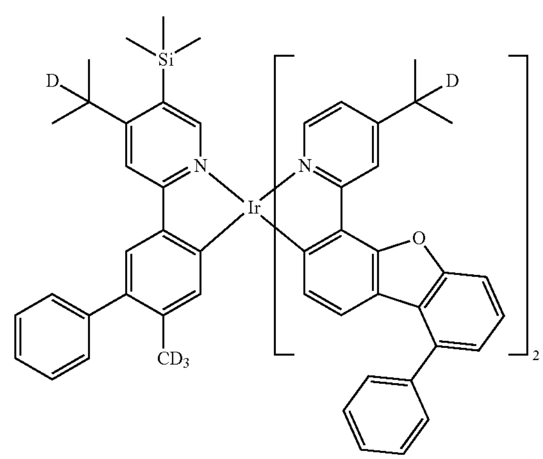

-continued
4304
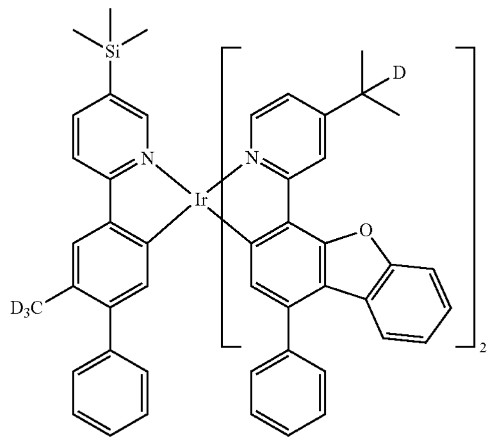
4305
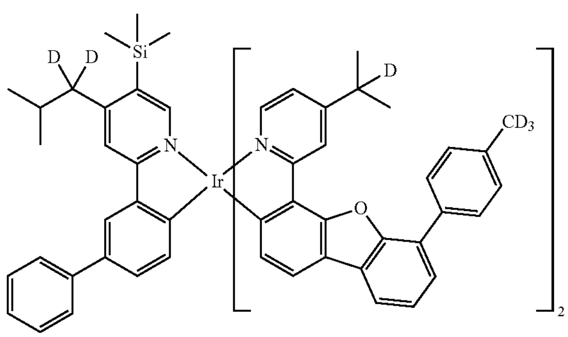
4306
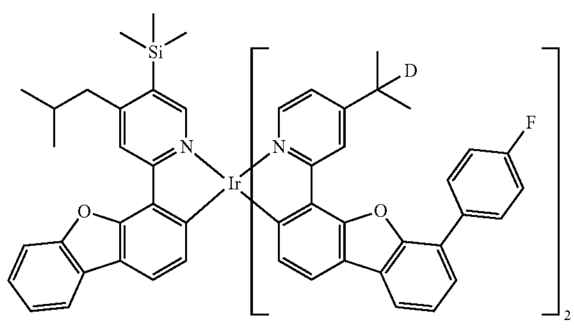
4307
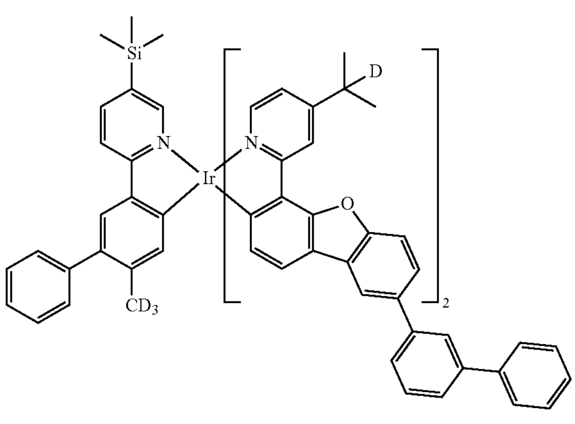
-continued
4308
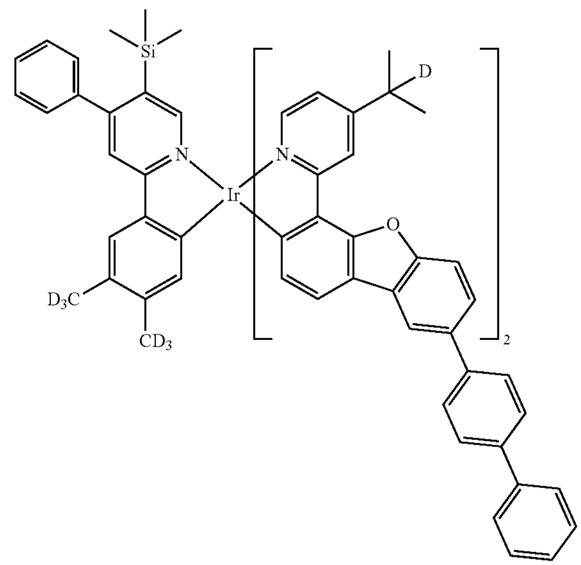
4309
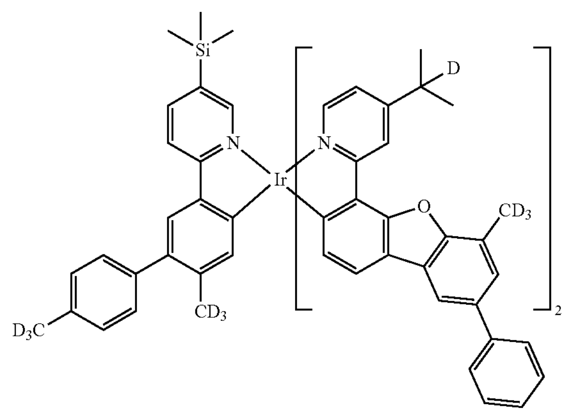
4310
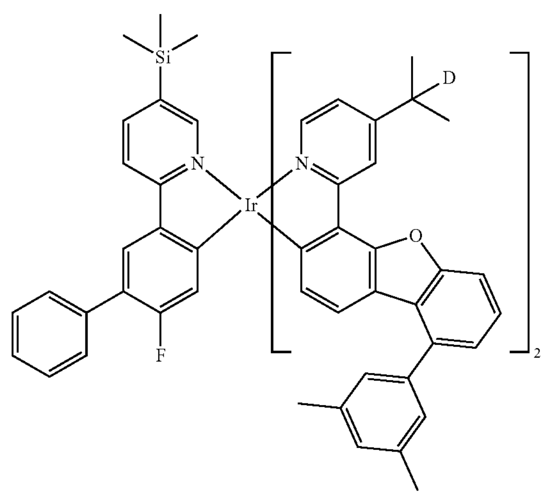

-continued
4311
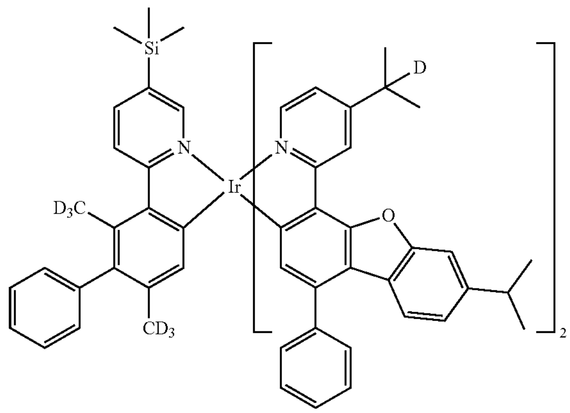
4312
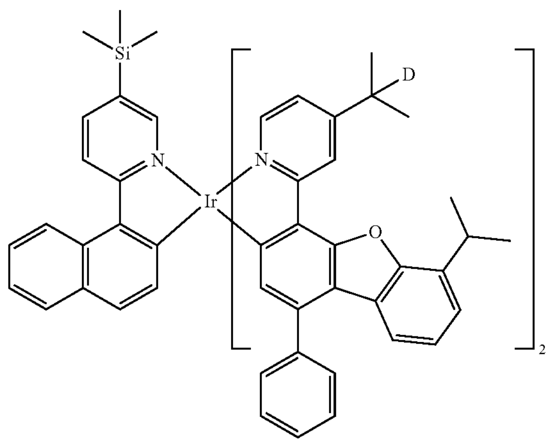
4313
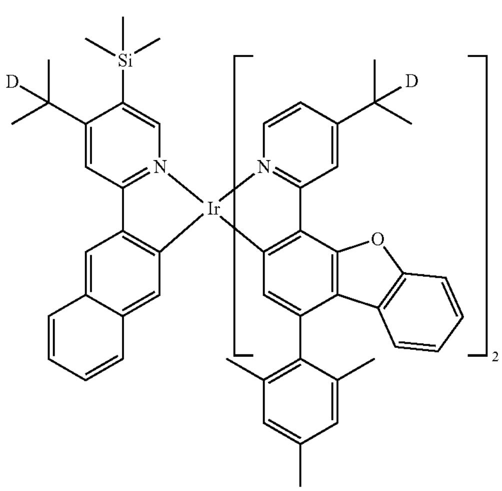
-continued
4314
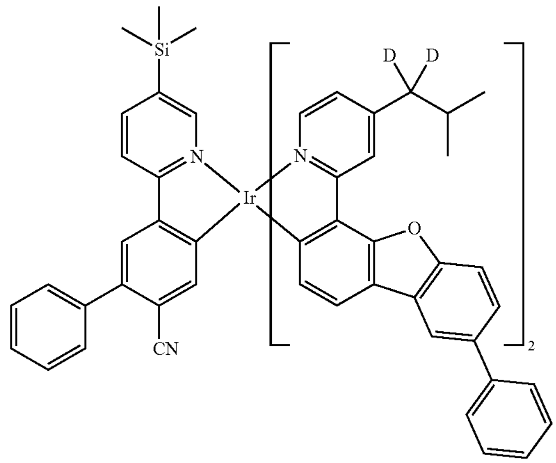
4315
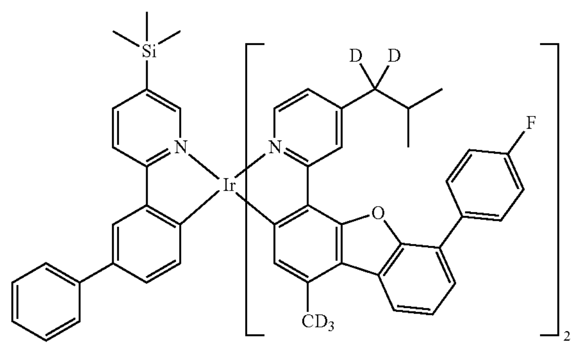
4316
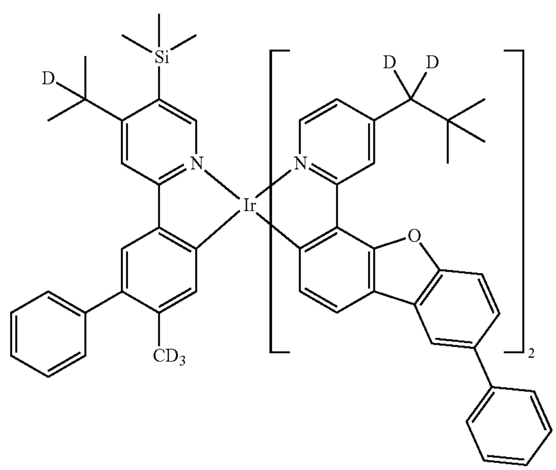

4317
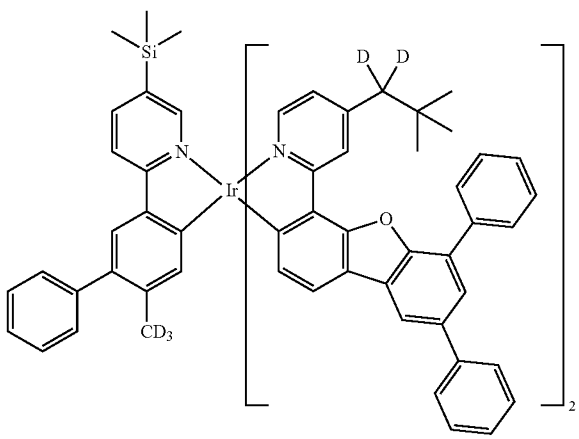
4318
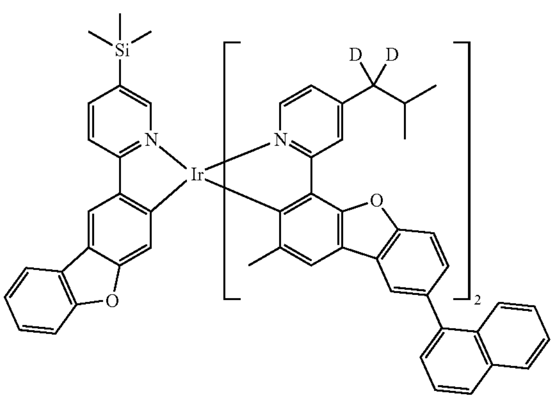
4319
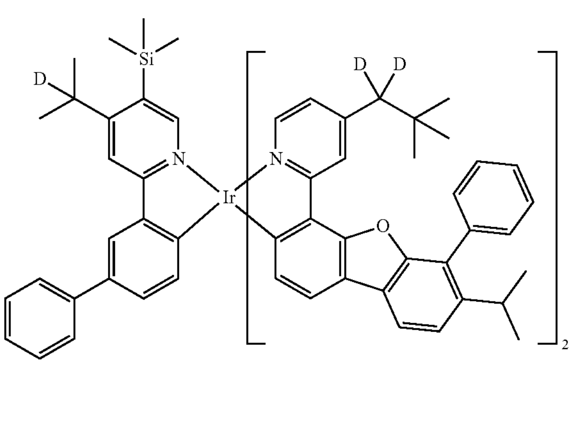
4320
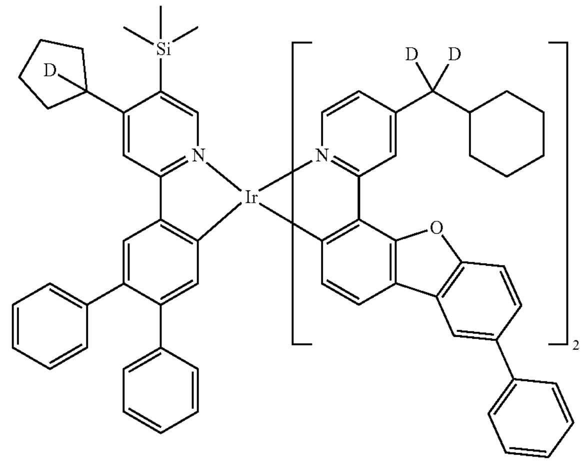
4321
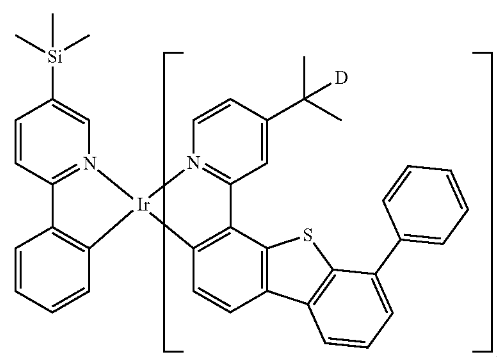
4322
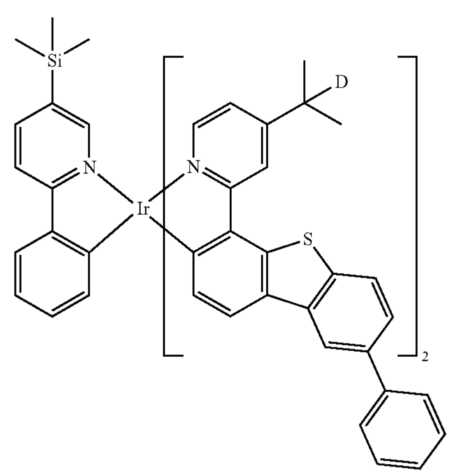

4323
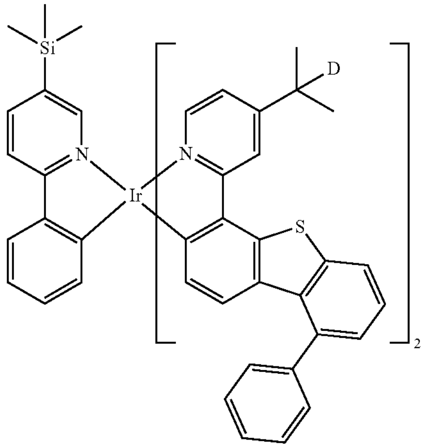
4324
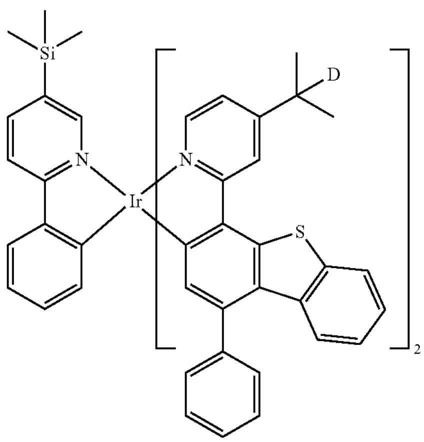
4325
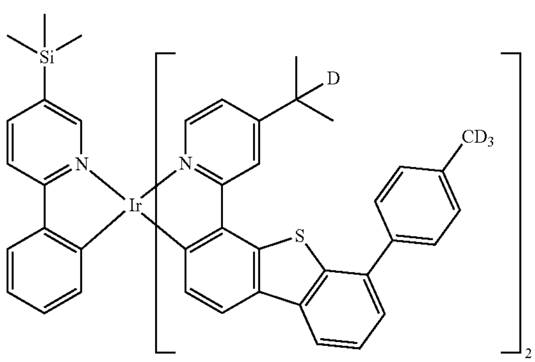
4326
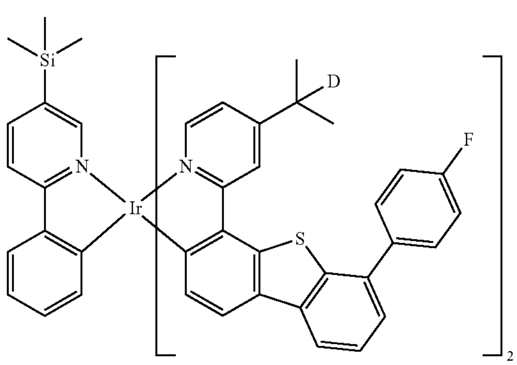
4327
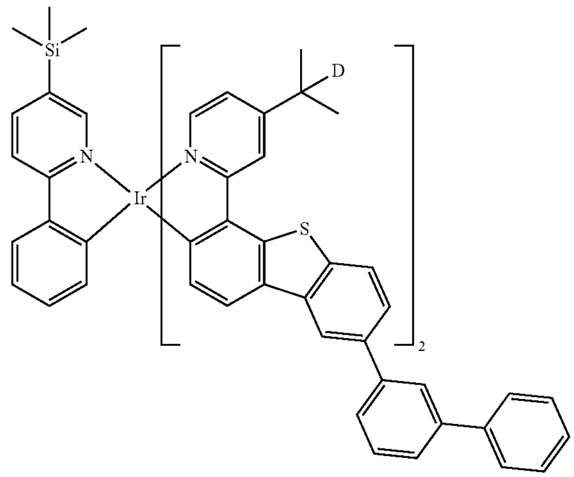
4328
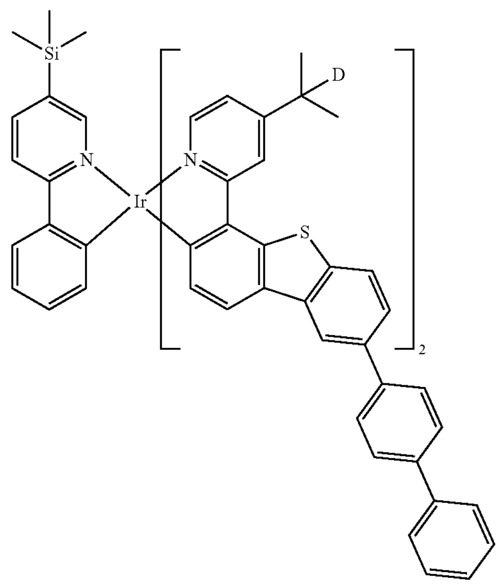
4329
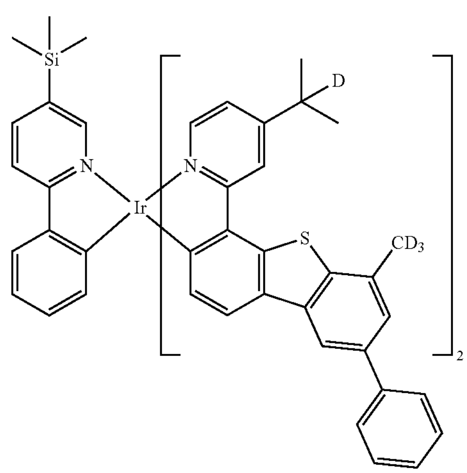

-continued
4330
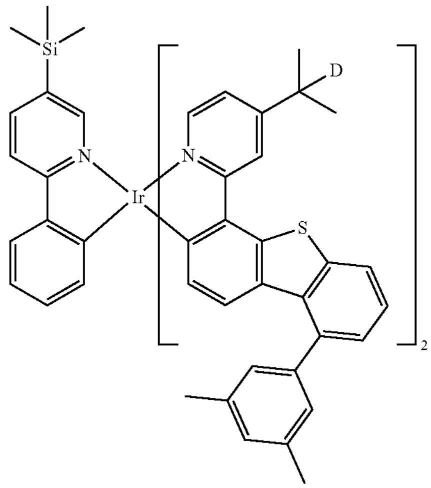
4331
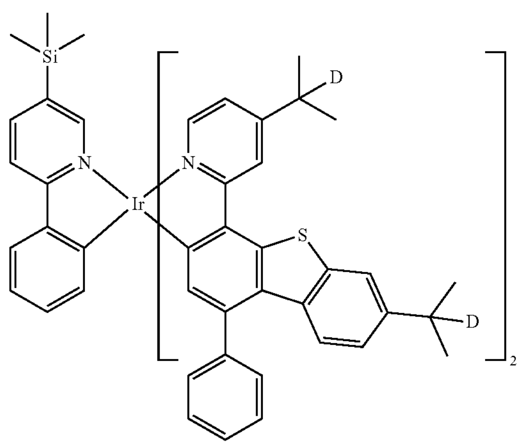
4332
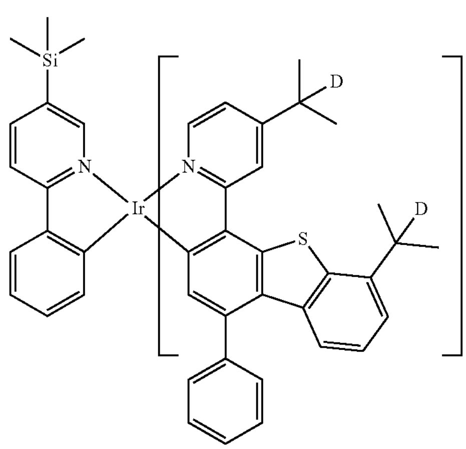
-continued
4333
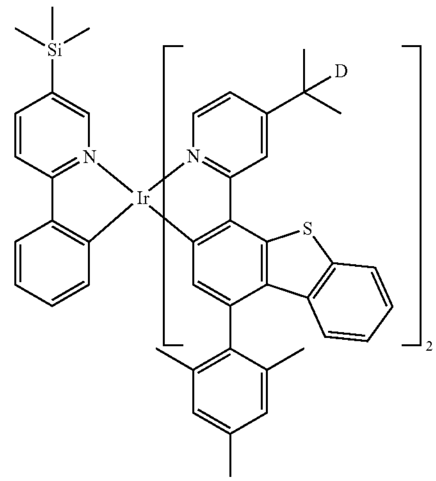
4334
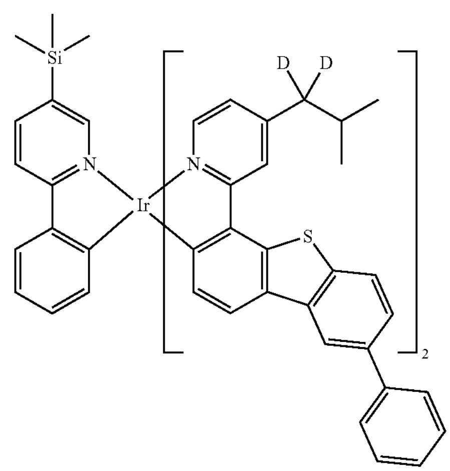
4335
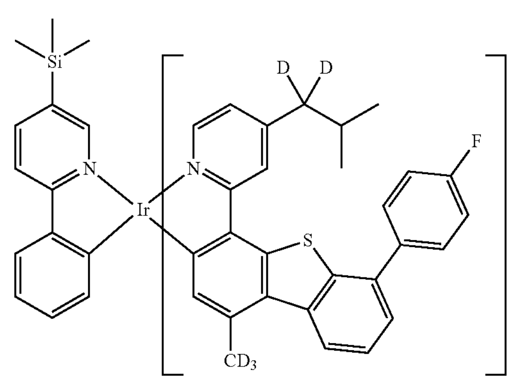

-continued
4336
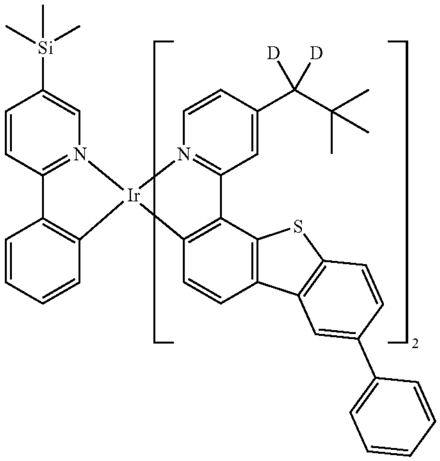
4337
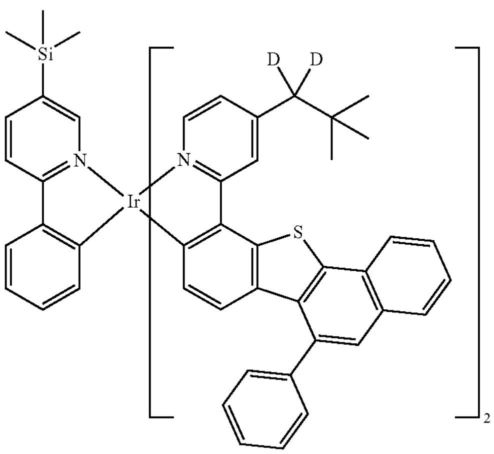
4338
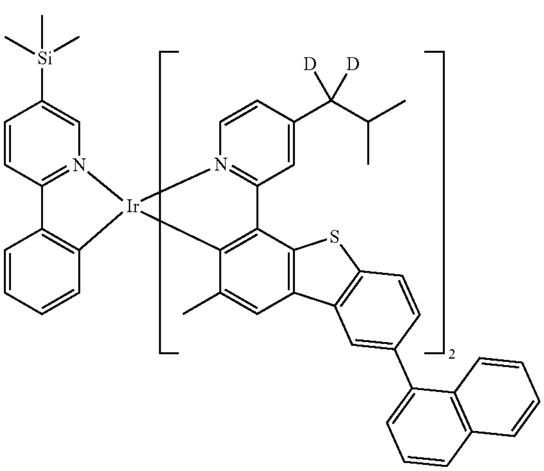
-continued
4339
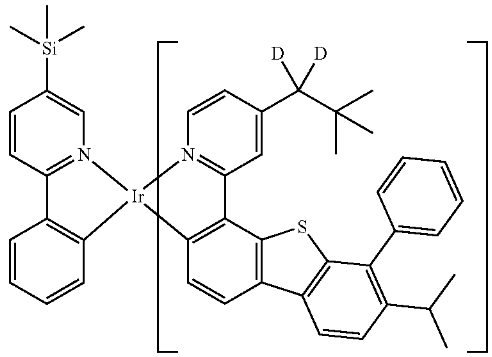
4340
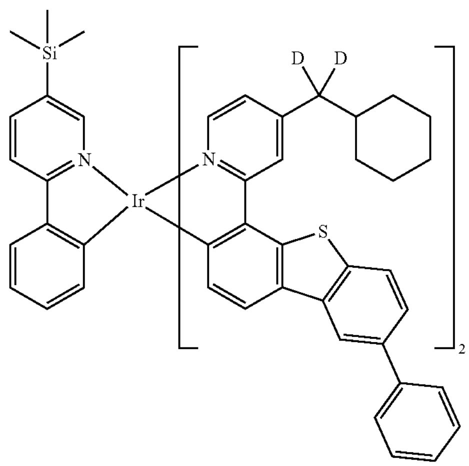
4341
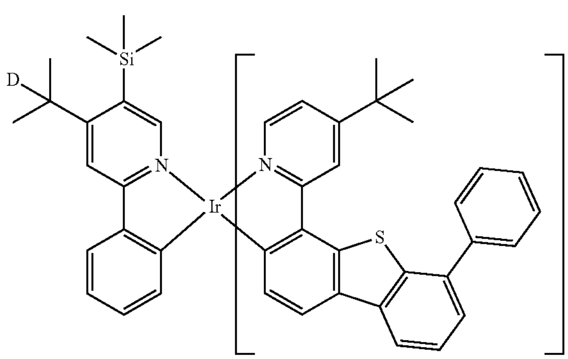

4342
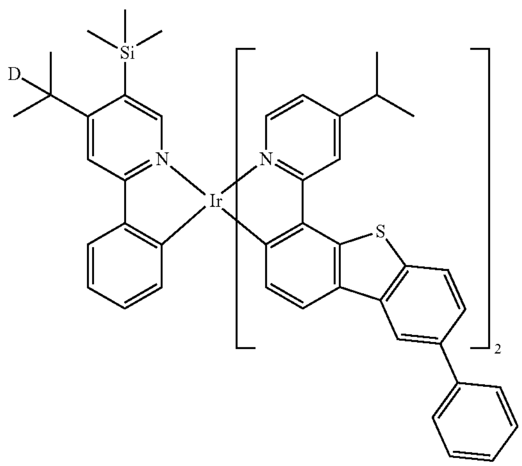
4343
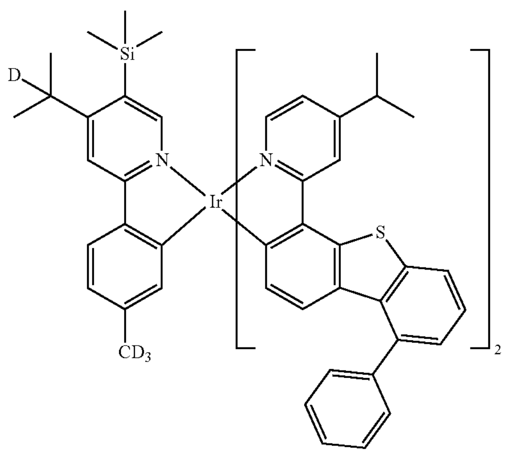
4344
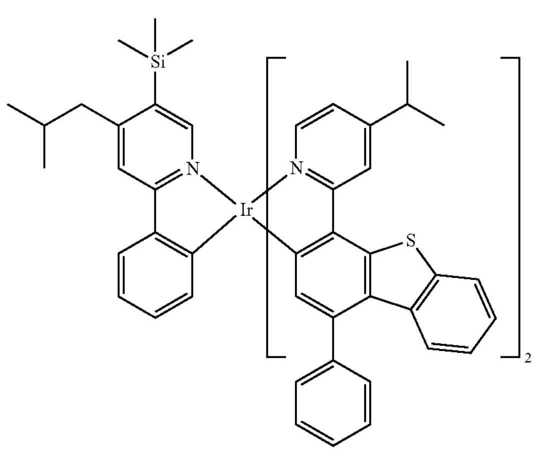
4345
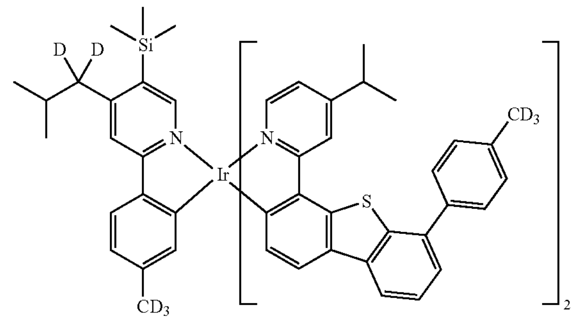
4346
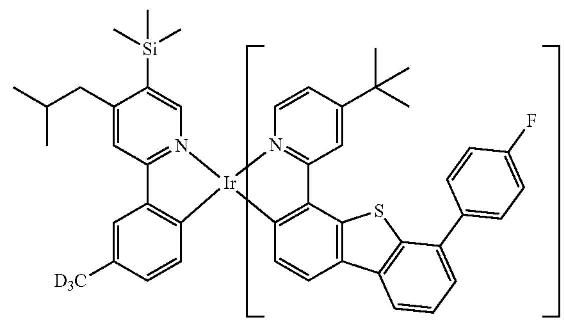
4347
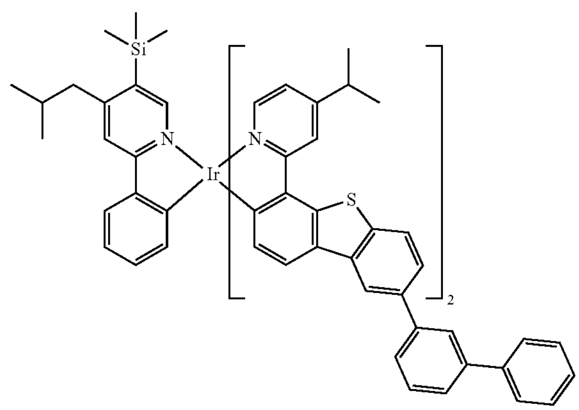
4348
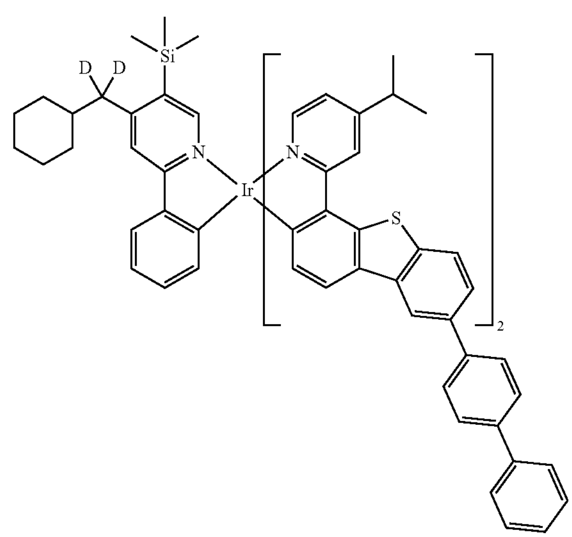

4349
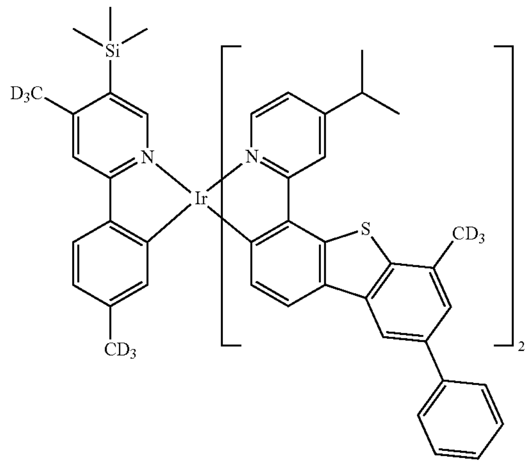
4350
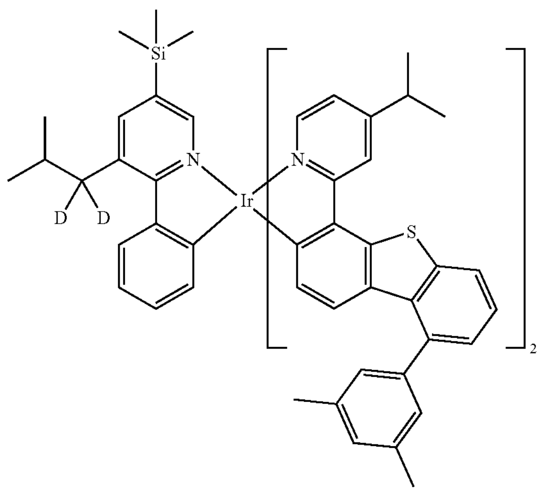
4351
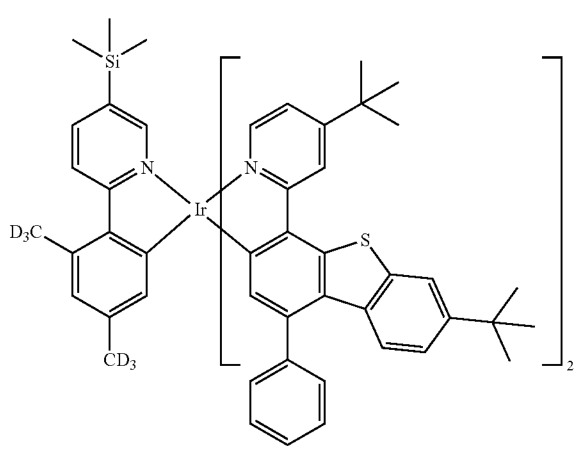
4352
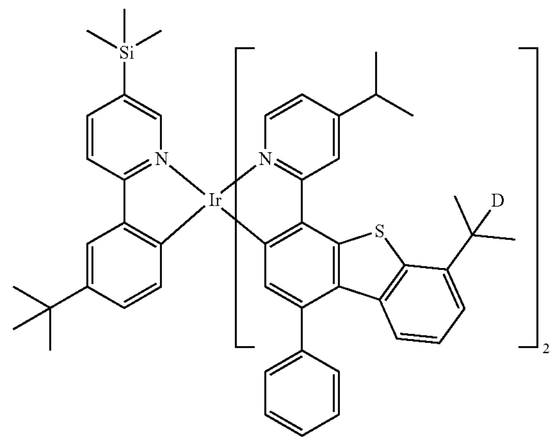
4353
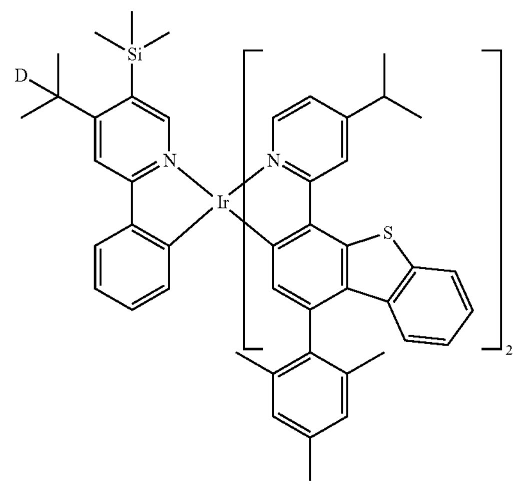
4354
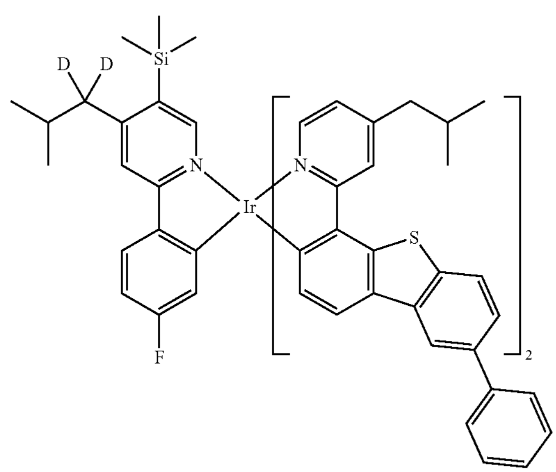

-continued
4355
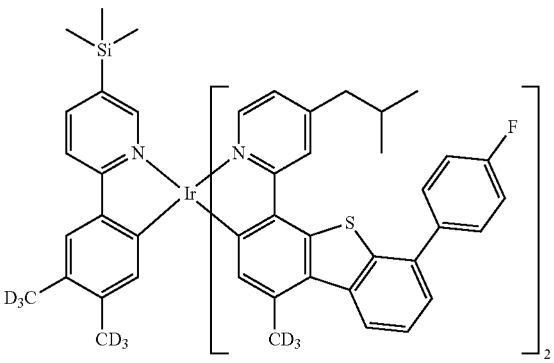
4356
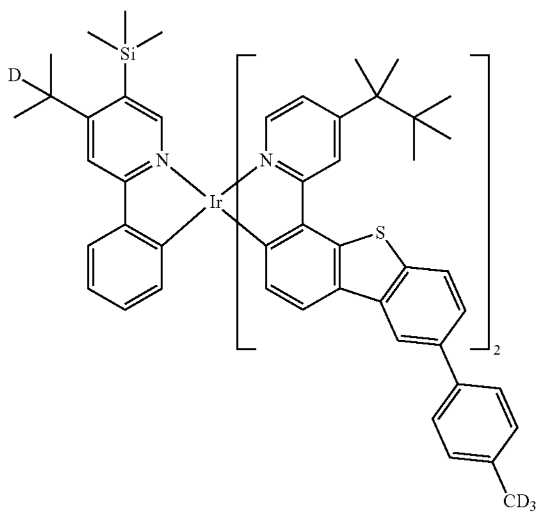
4357
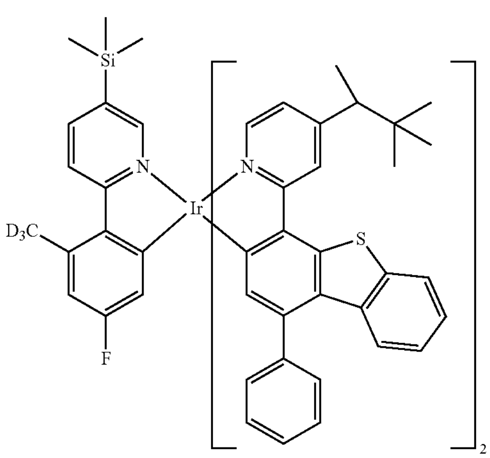
-continued
4358
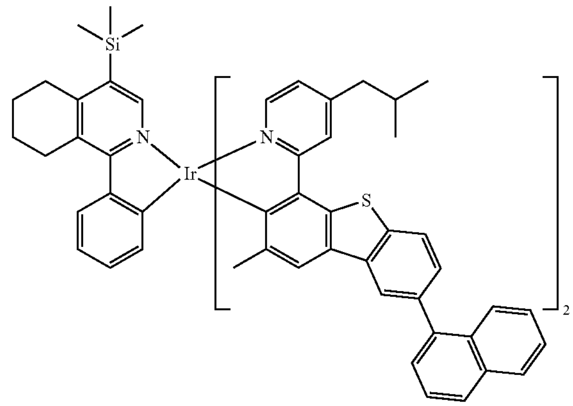
4359
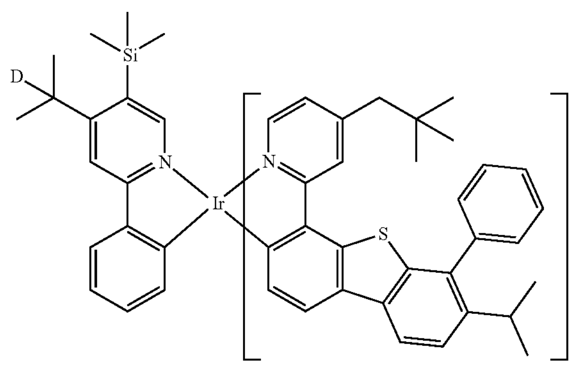
4360
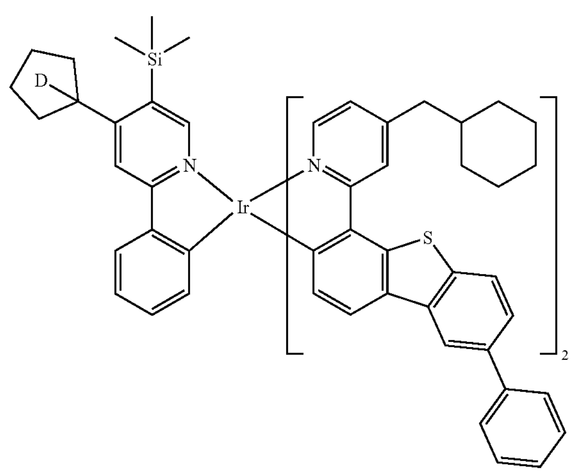

-continued
4361
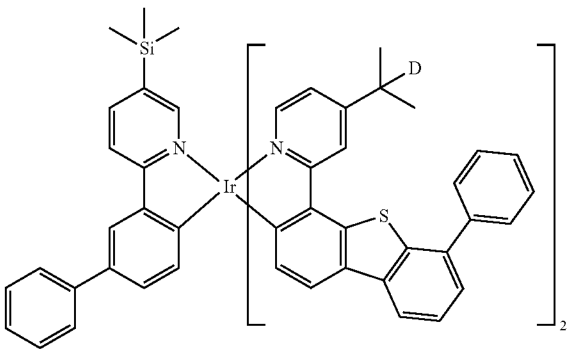
4362
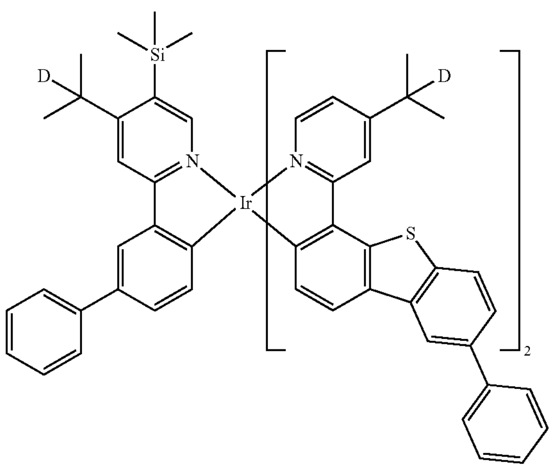
4363
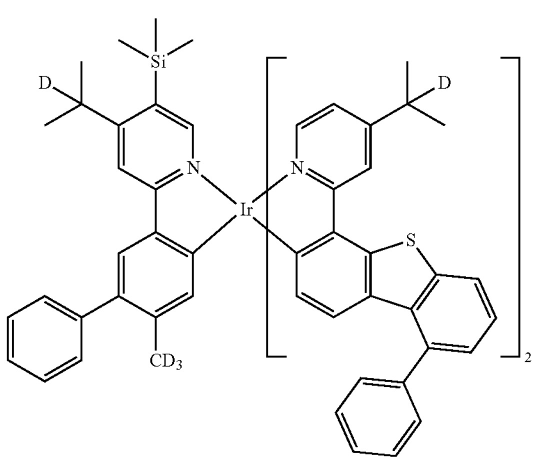
-continued
4364
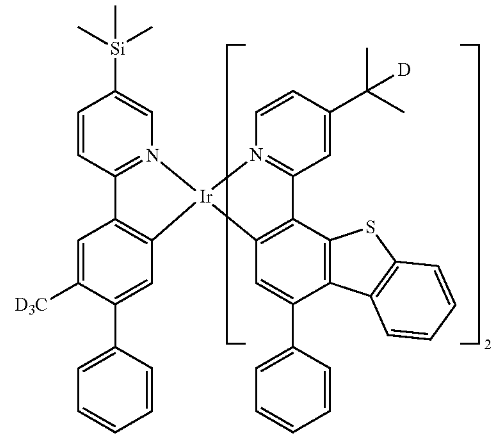
4365
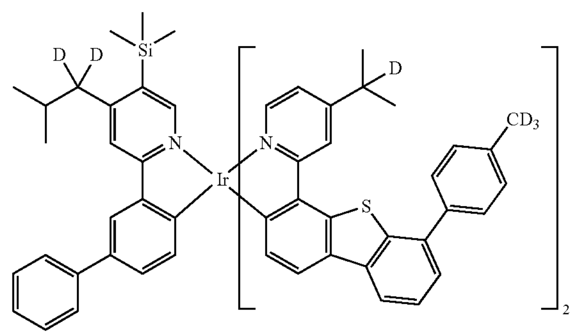
4366
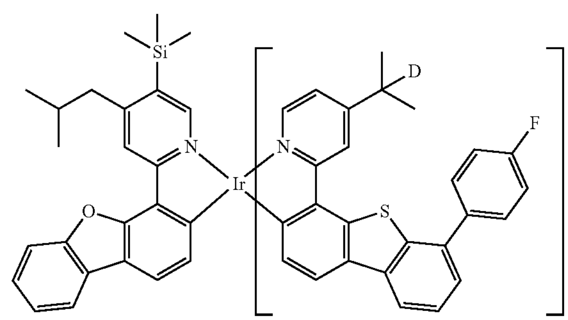
4367
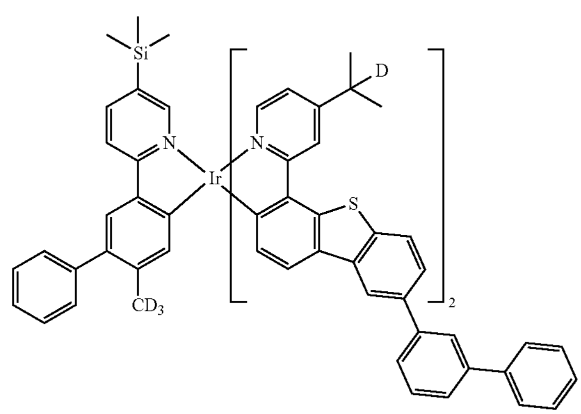

-continued
4368
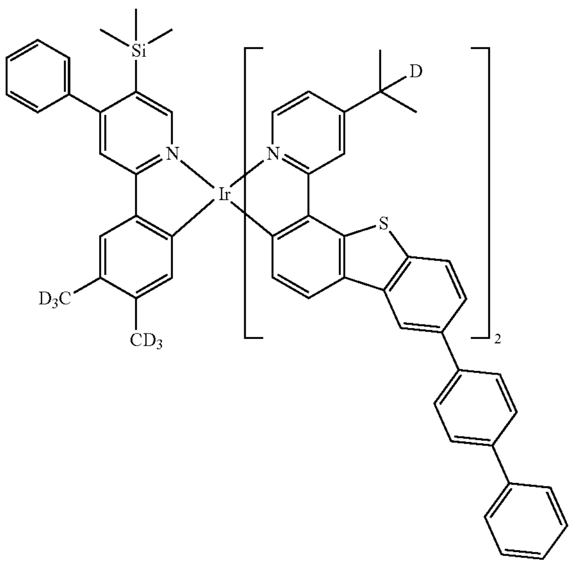
4369
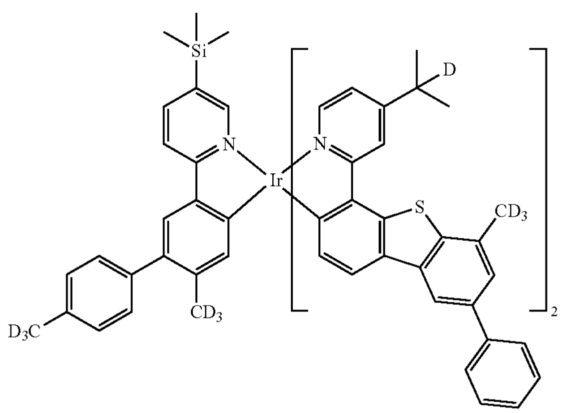
4370
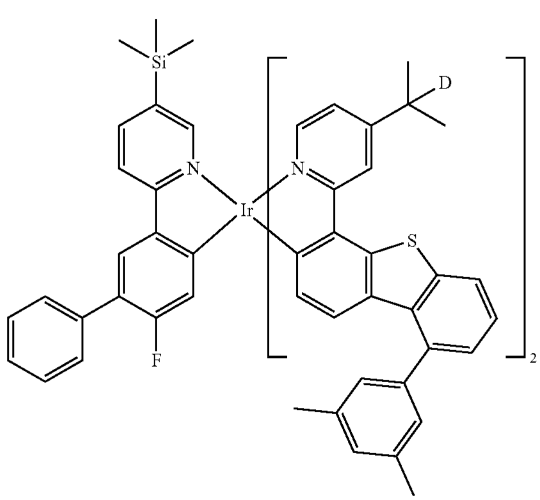
-continued
4371
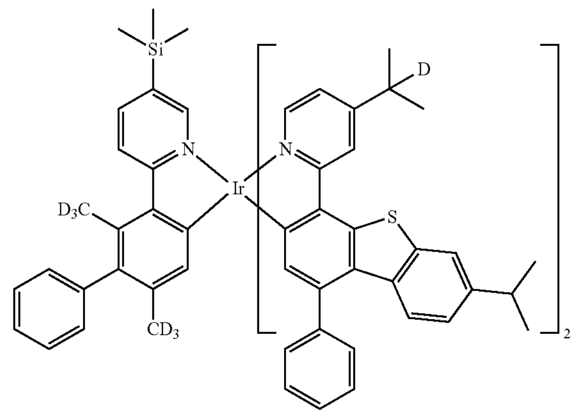
4372
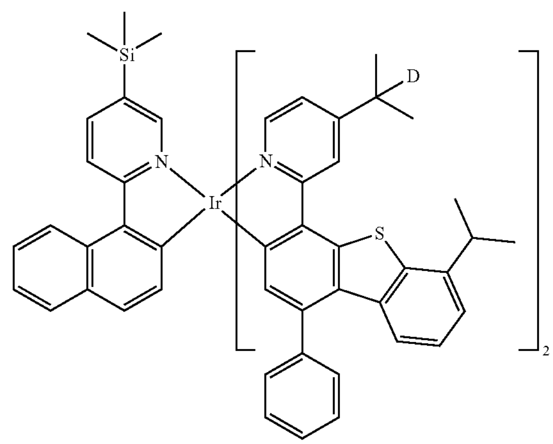
4373
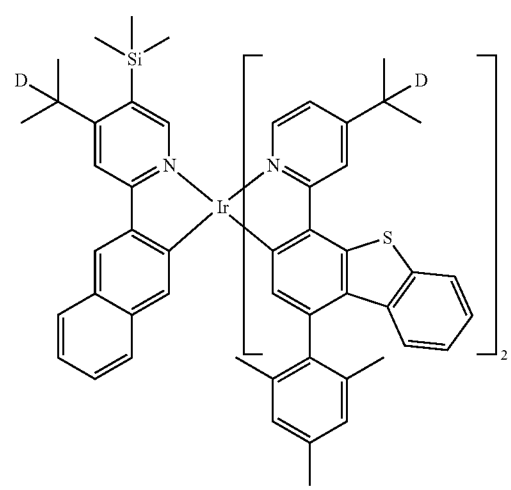

4374
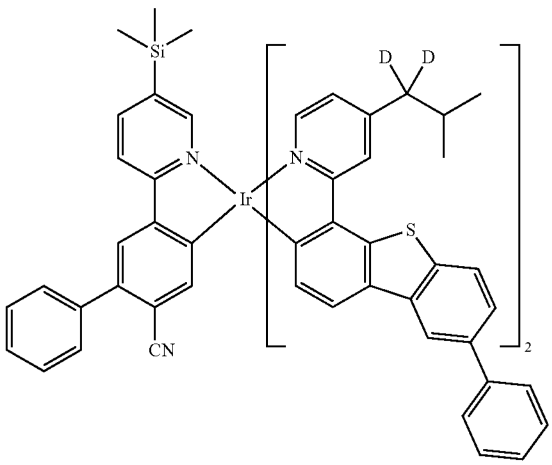
4375
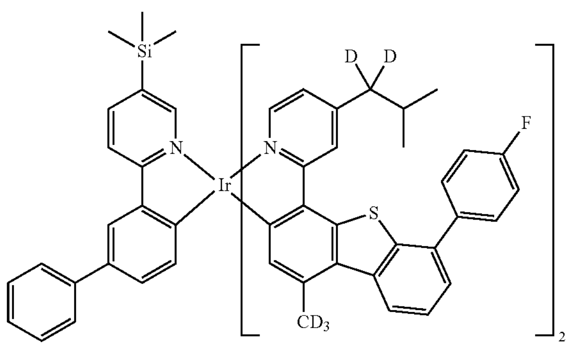
4376
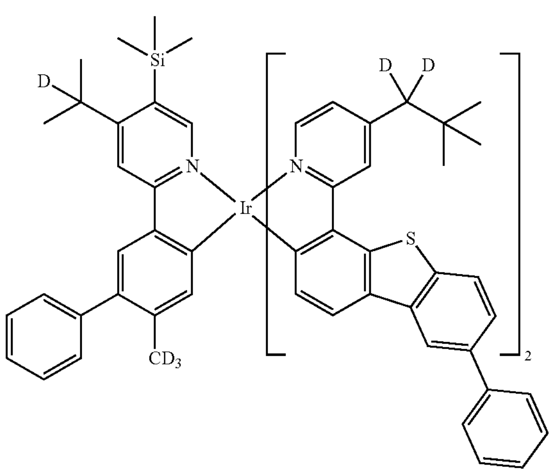
4377
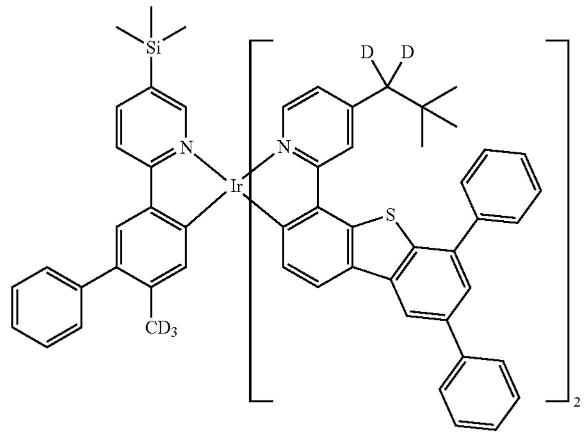
4378
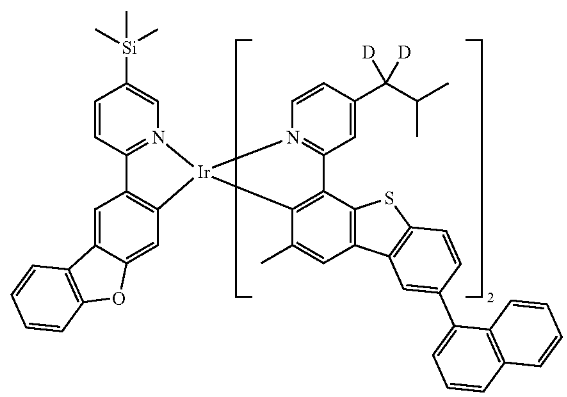
4379
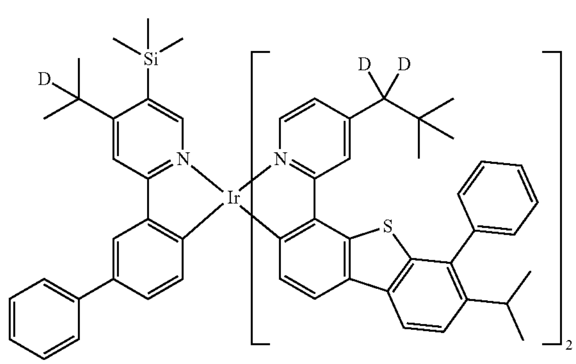

-continued
4380
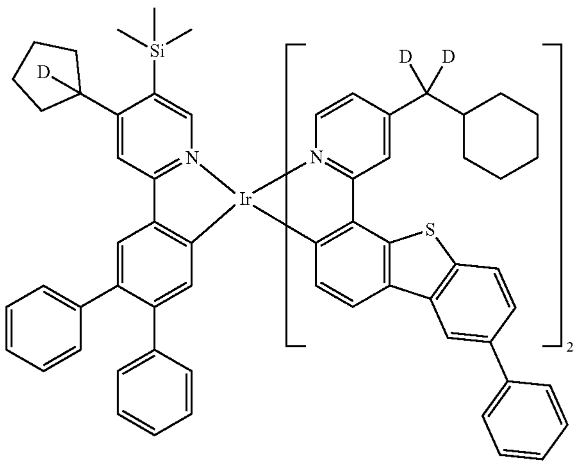
4381
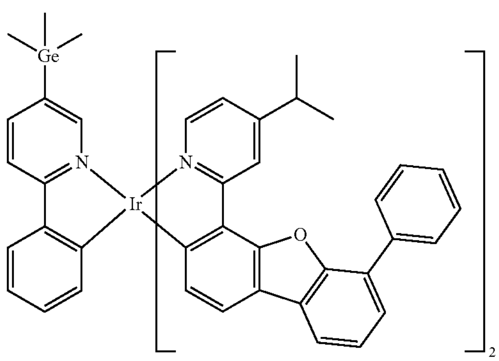
4382
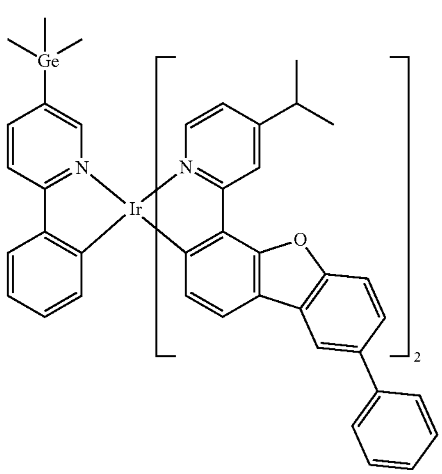
-continued
4383
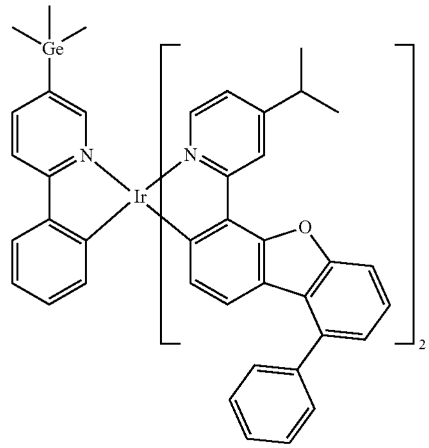
4384
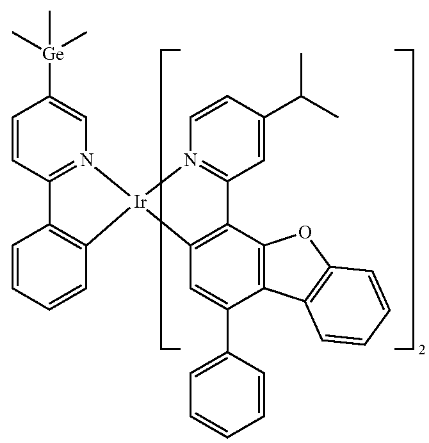
4385
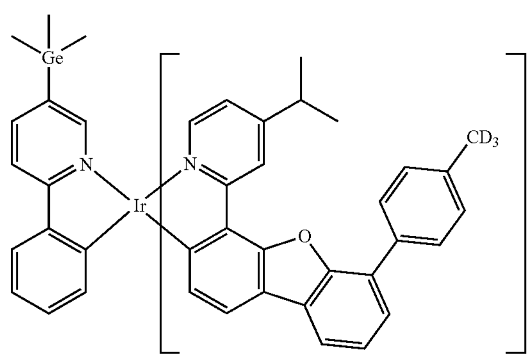
4386
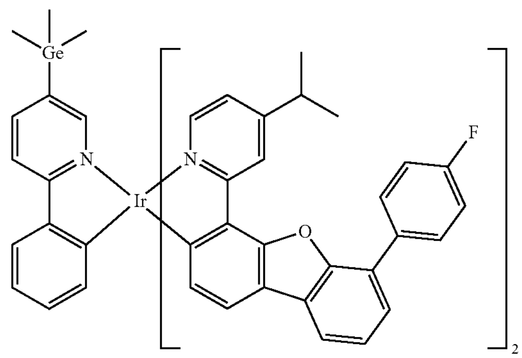

4387
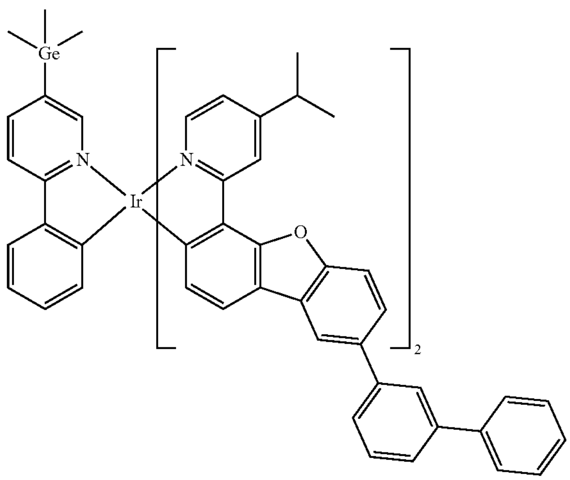
4388
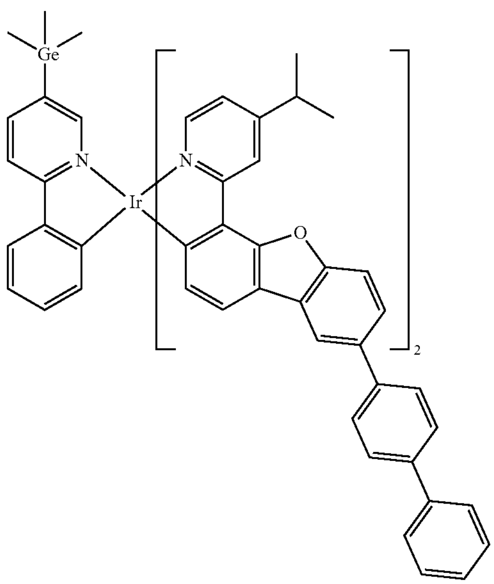
4389
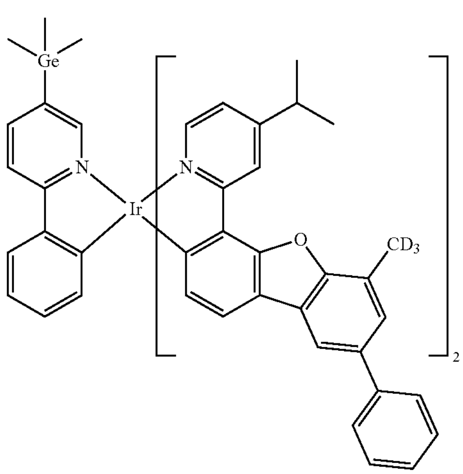
4390
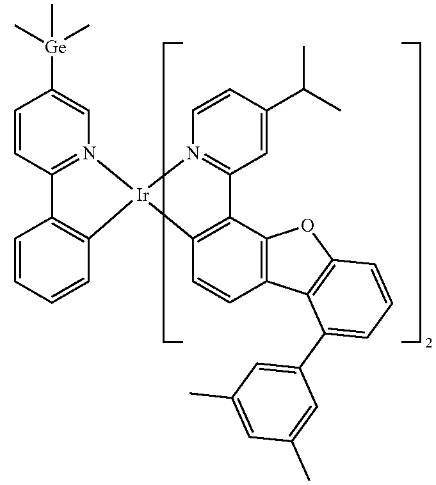
4391
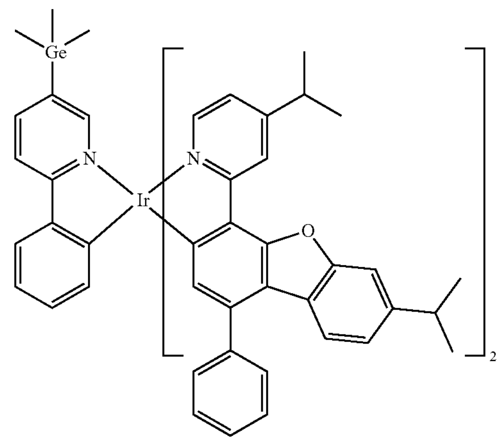
4392
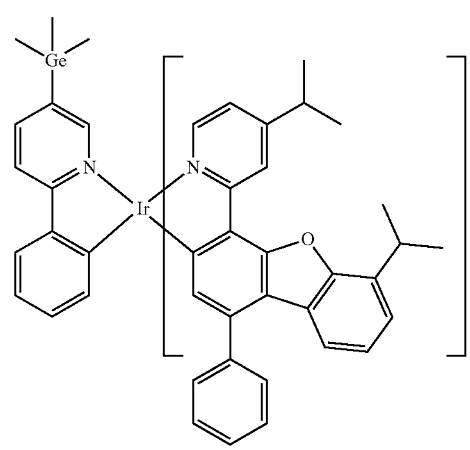

-continued
4393
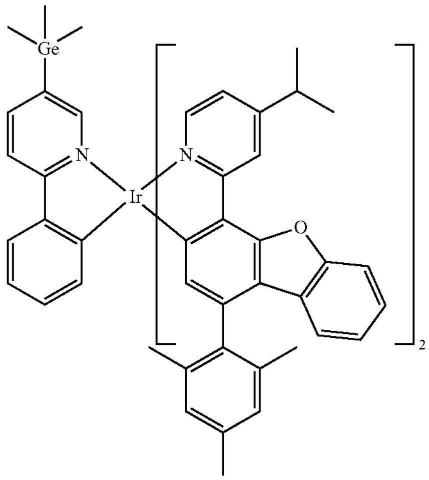
4394
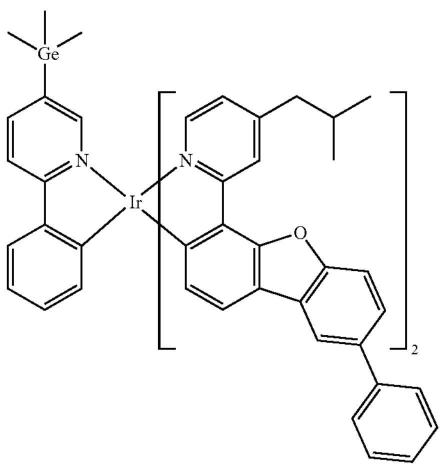
4395
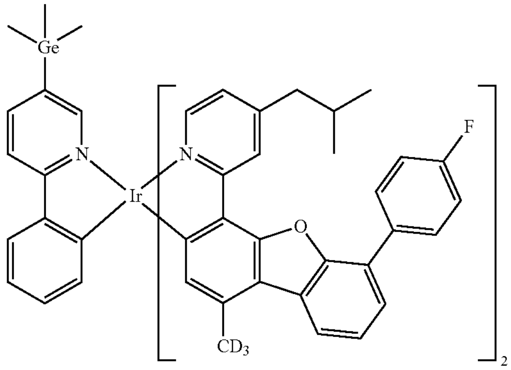
-continued
4396
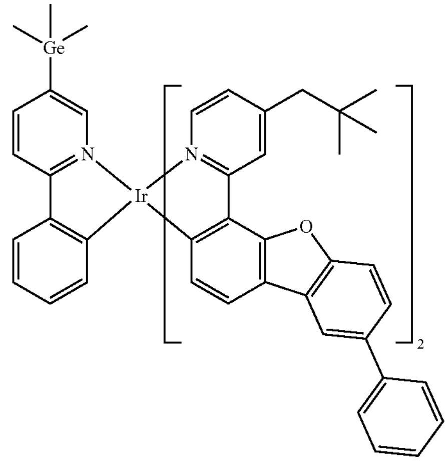
4397
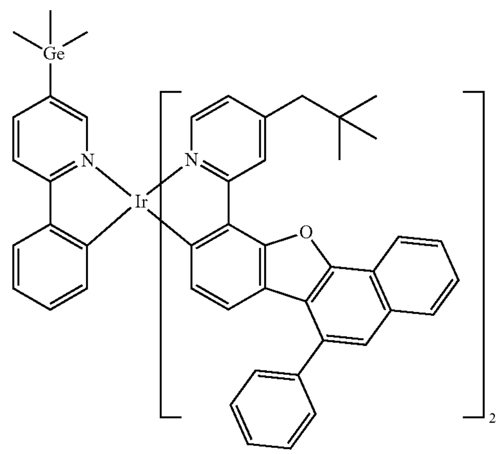
4398
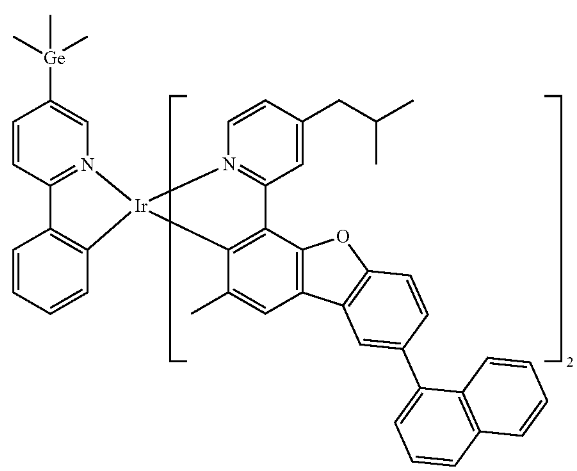

-continued
4399
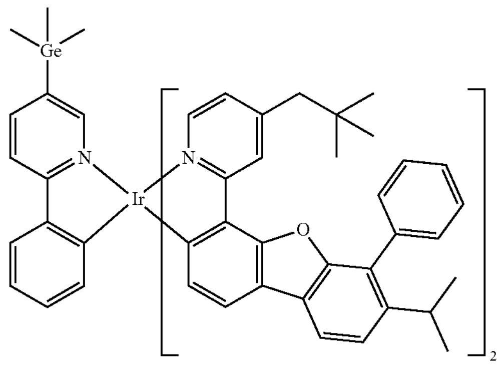
4400
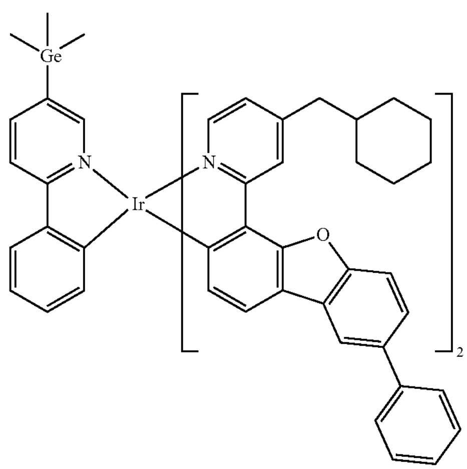
4401
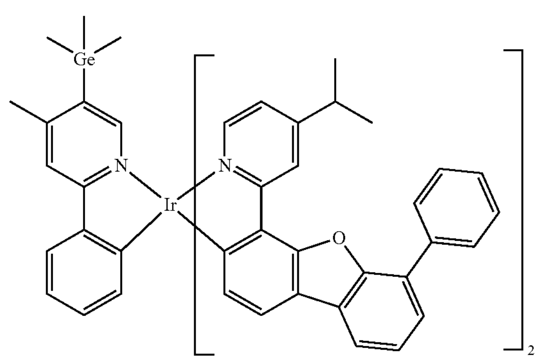
-continued
4402
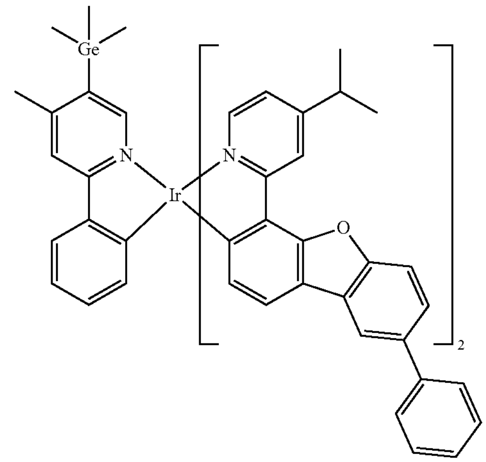
4403
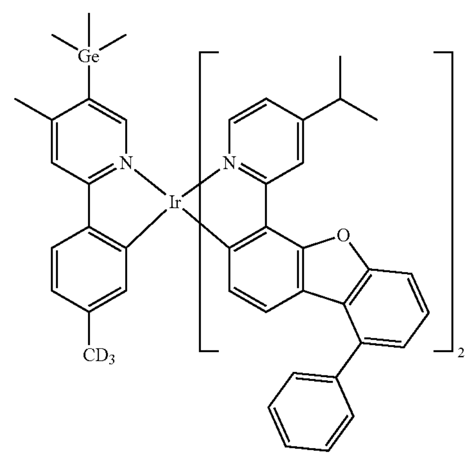
4404
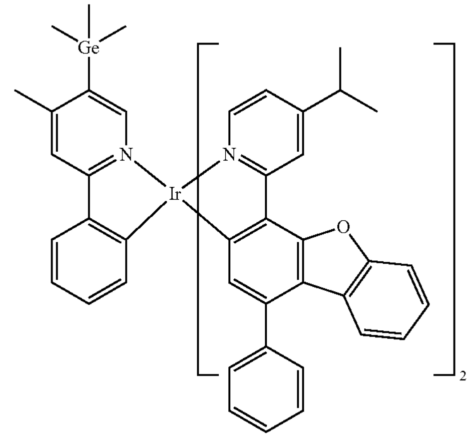

-continued
4405
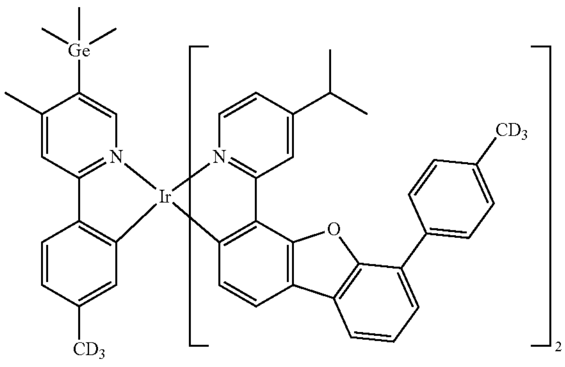
4406
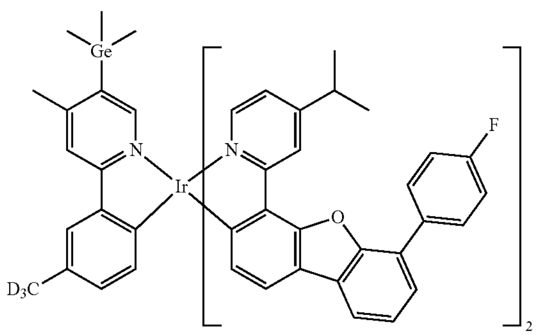
4407
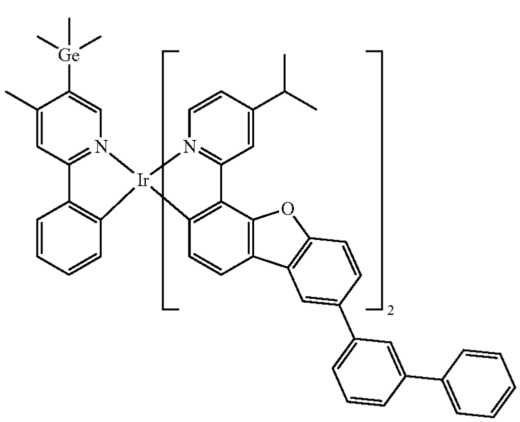
-continued
4408
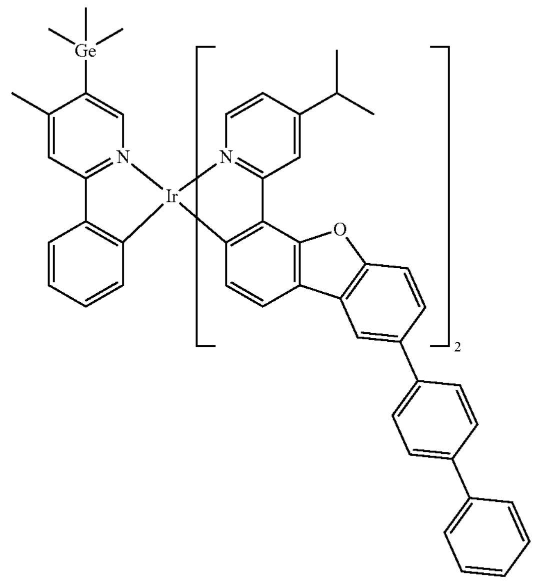
4409
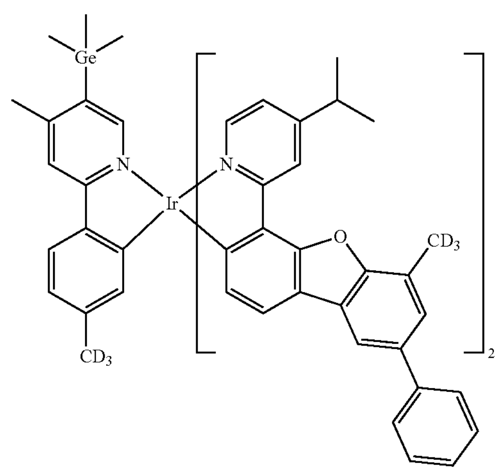
4410
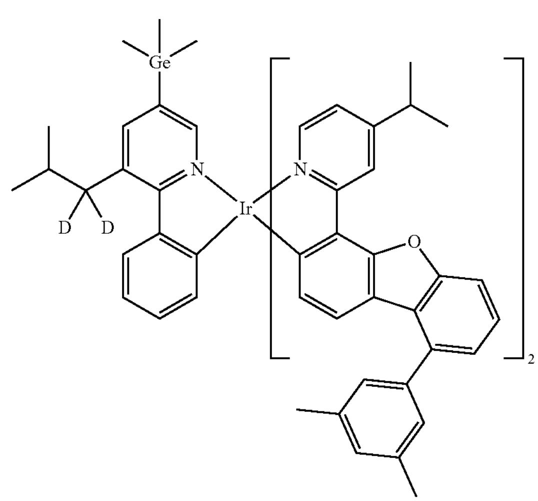

-continued
4411
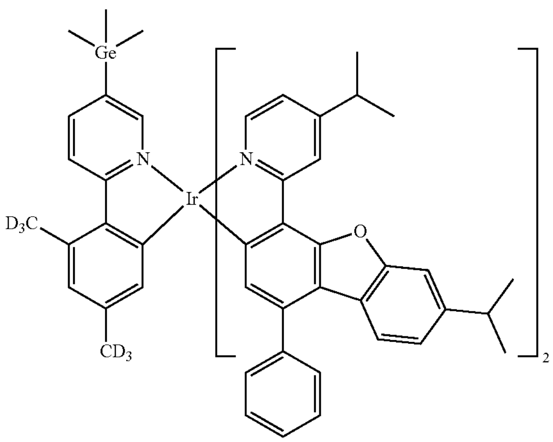
4412
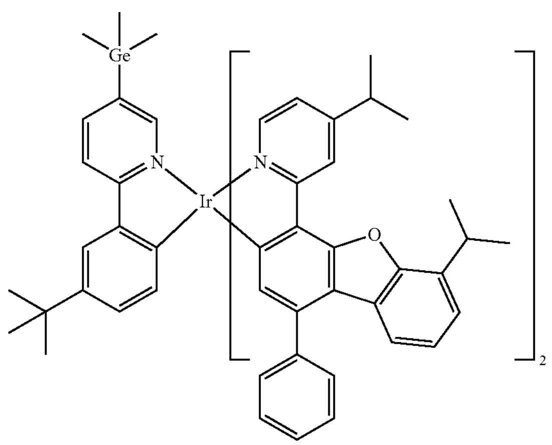
4413
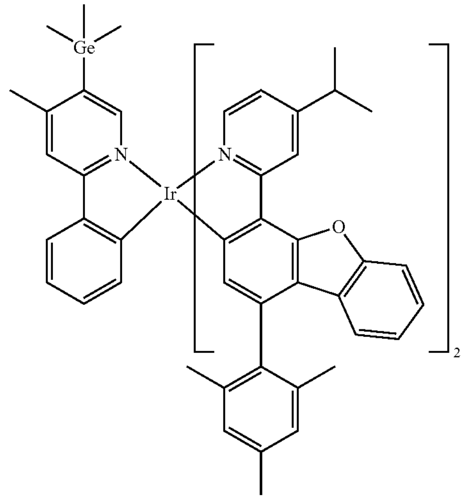
-continued
4414
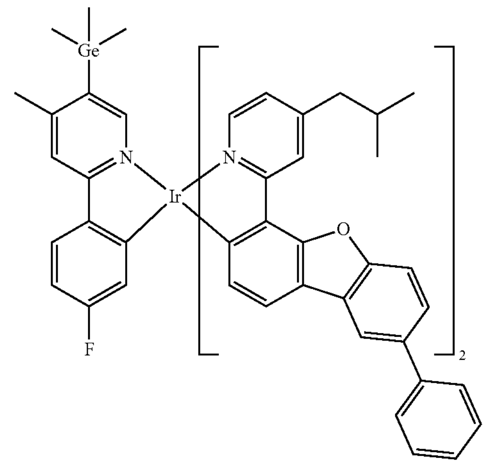
4415
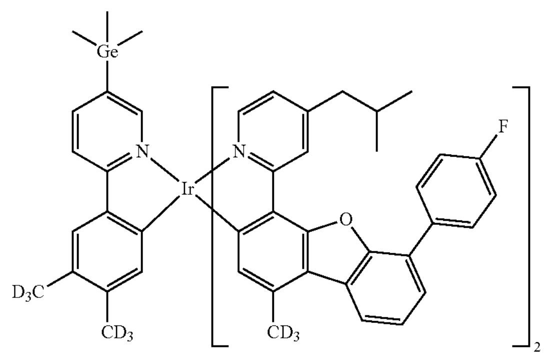
4416
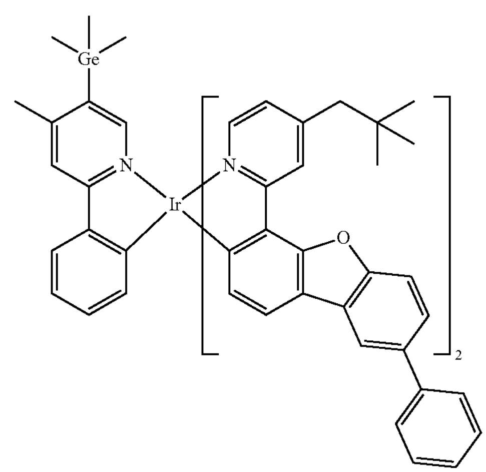

4417
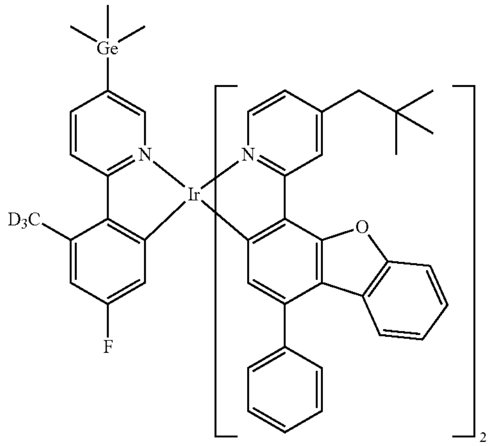
4418
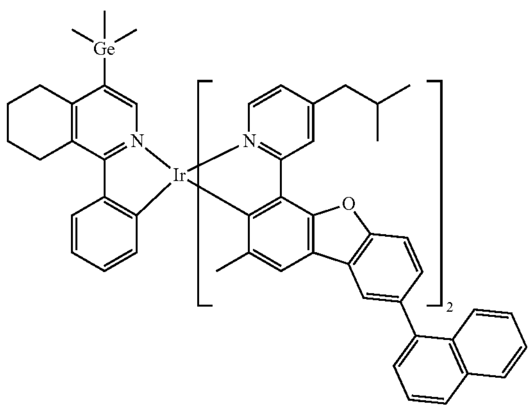
4419
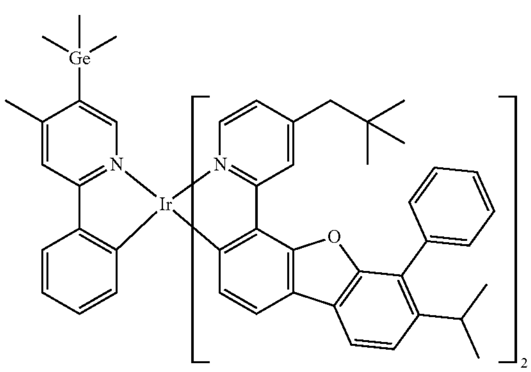
4420
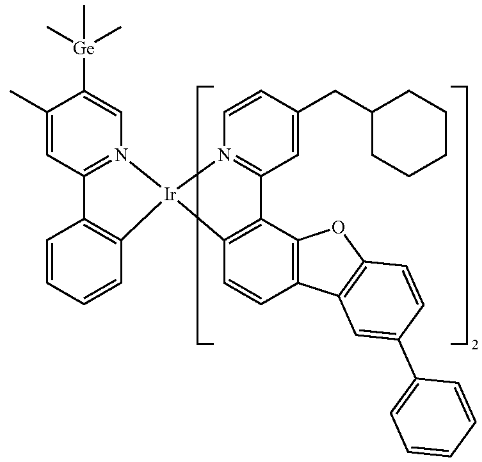
4421
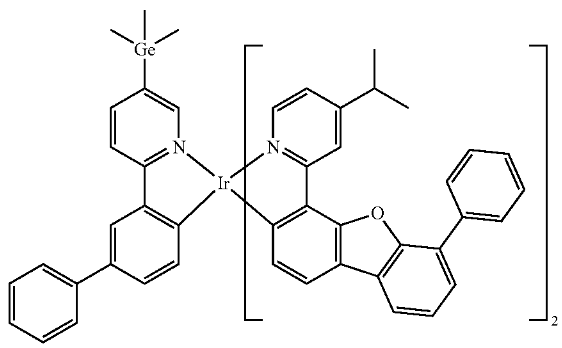
4422
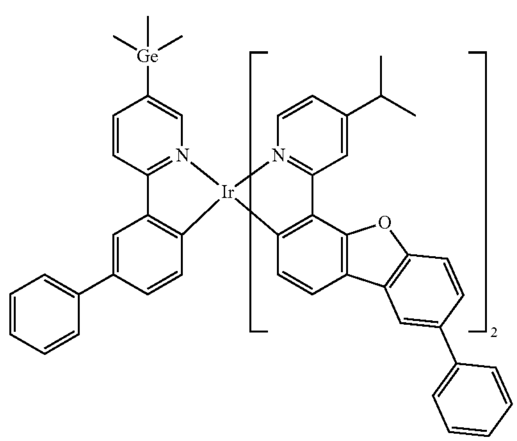

4423
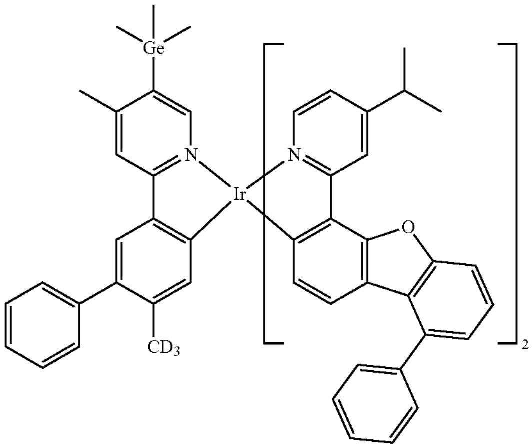
4424
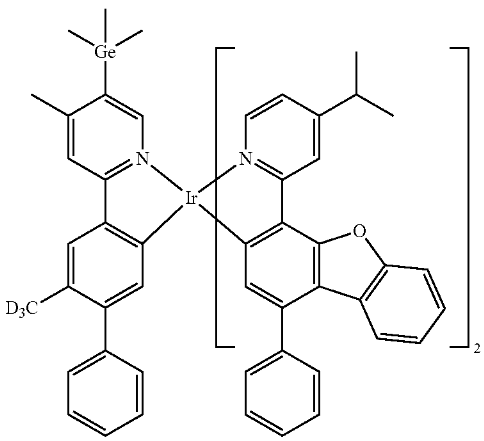
4425
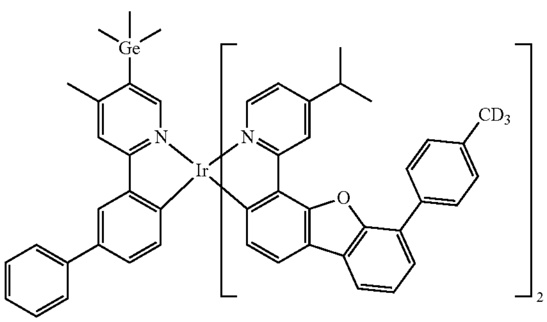
4426
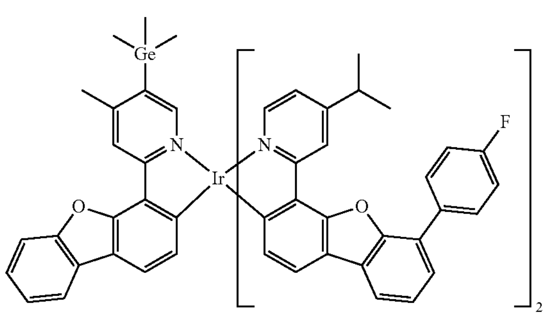
4427
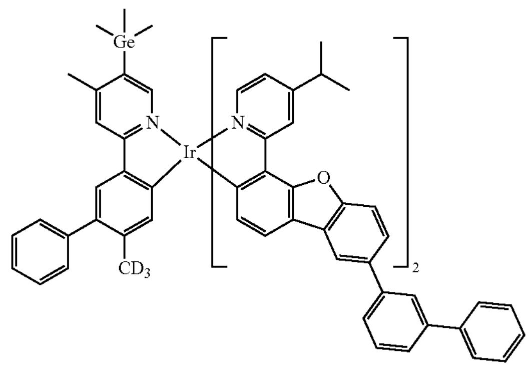
4428
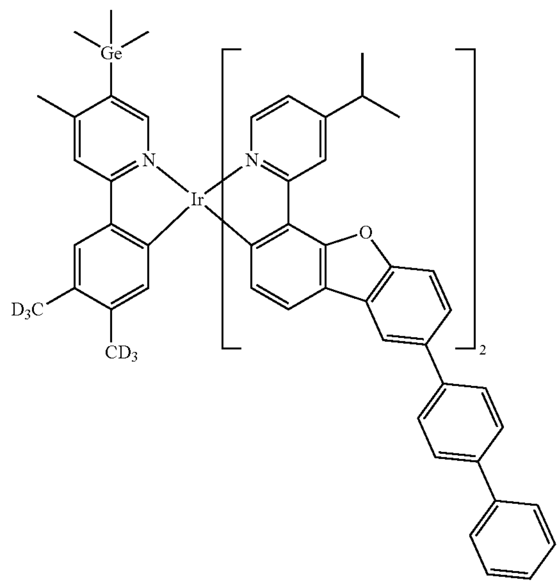
4429
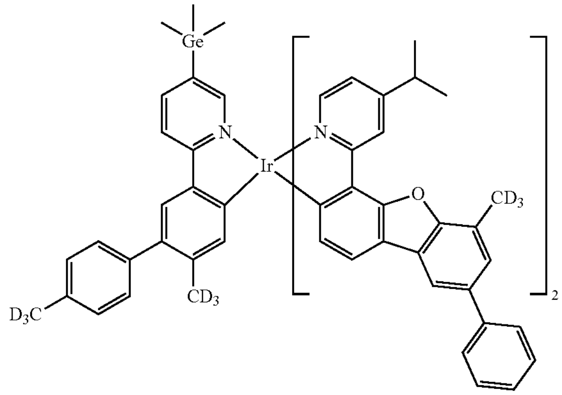

-continued
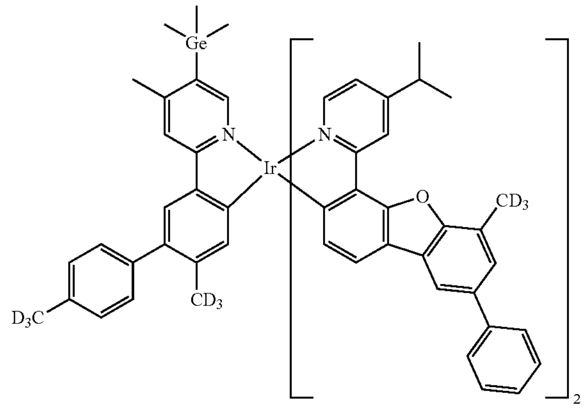
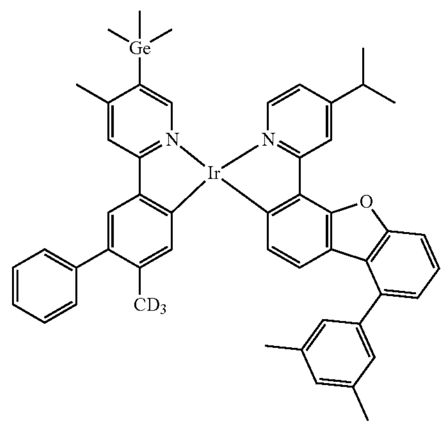
4430
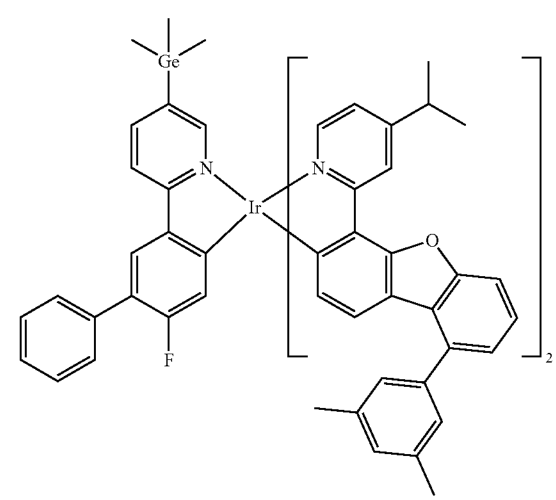
-continued
4431
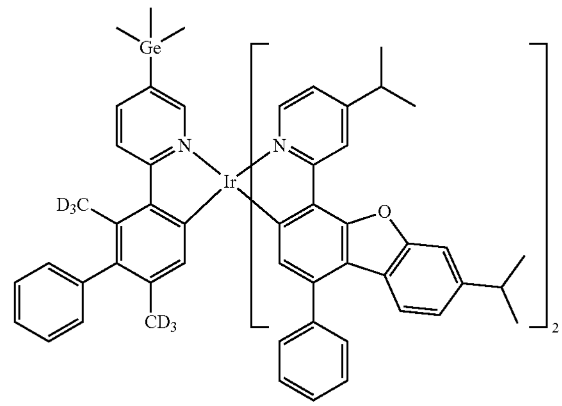
4432
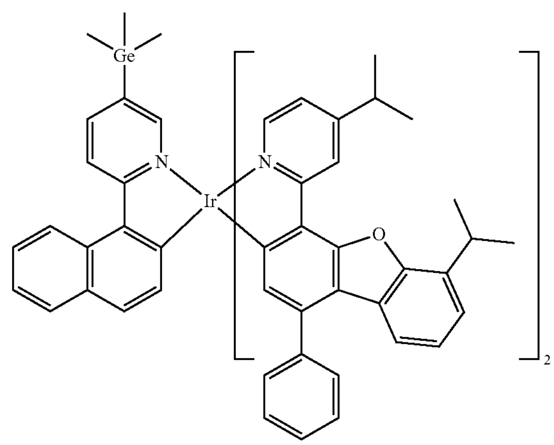
4433
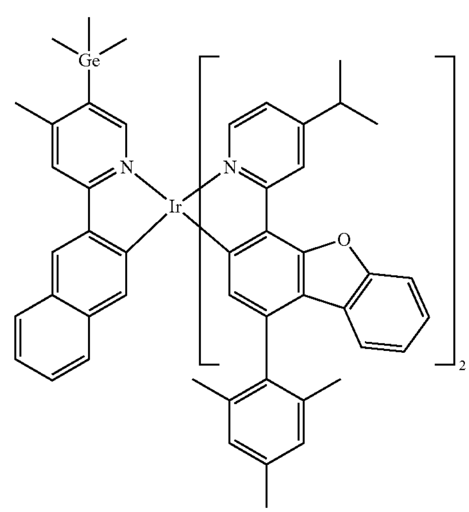

-continued
4434
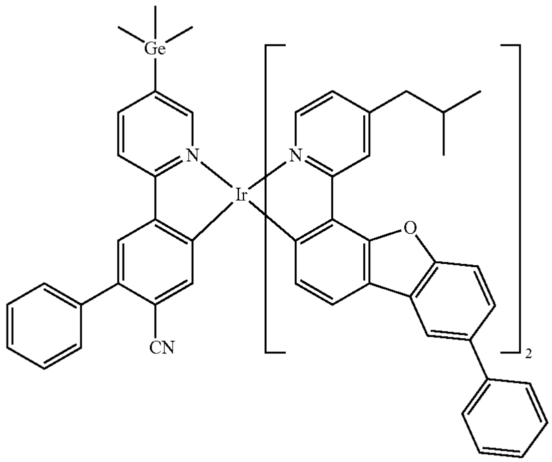
4435
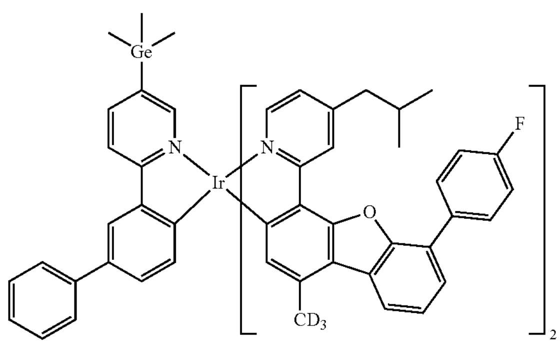
4436
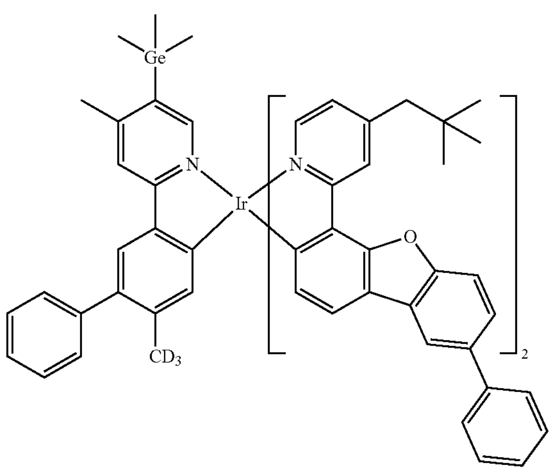
-continued
4437
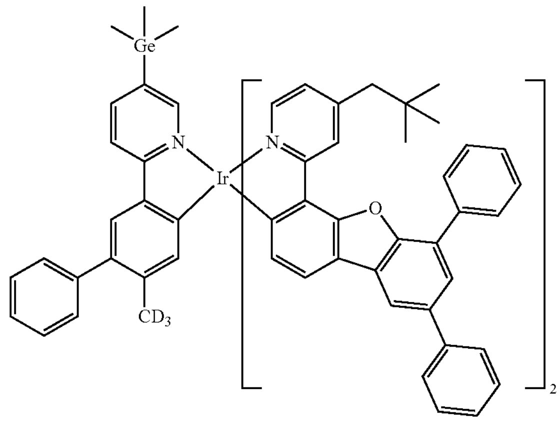
4438
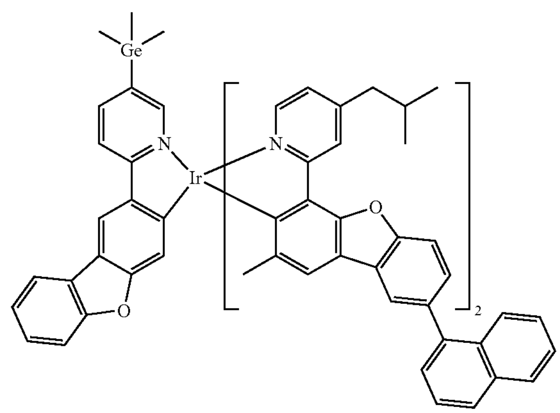
4439
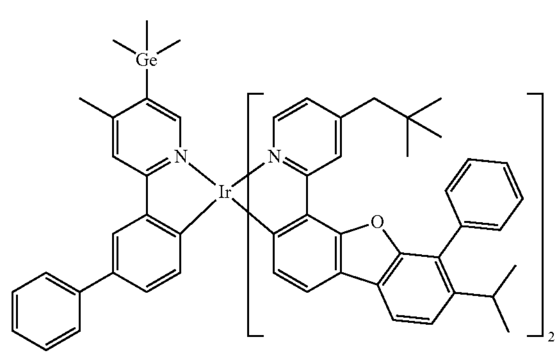

4440
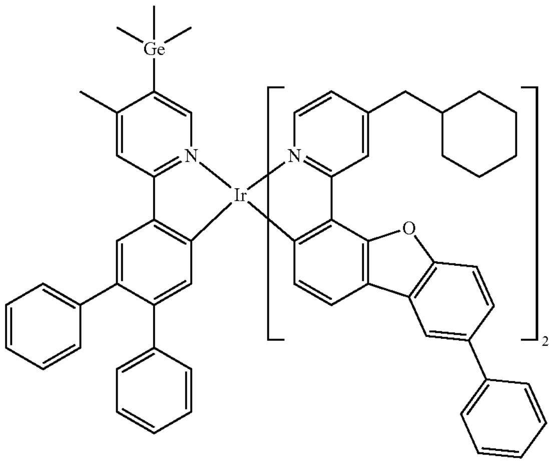
4441
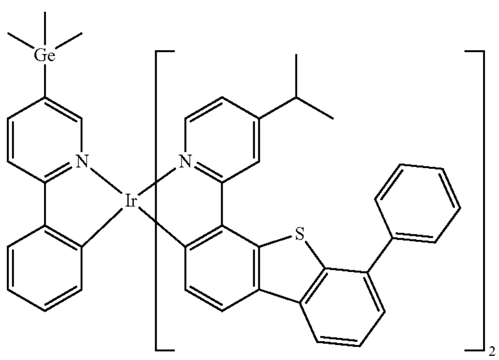
4442
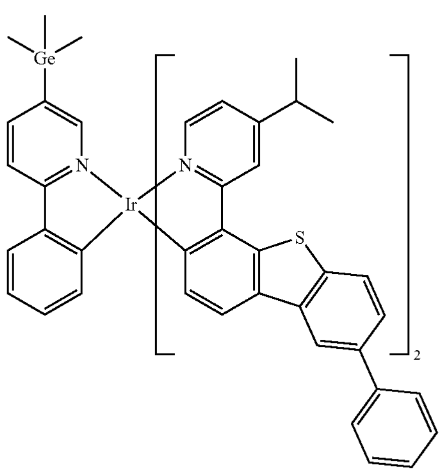
4443
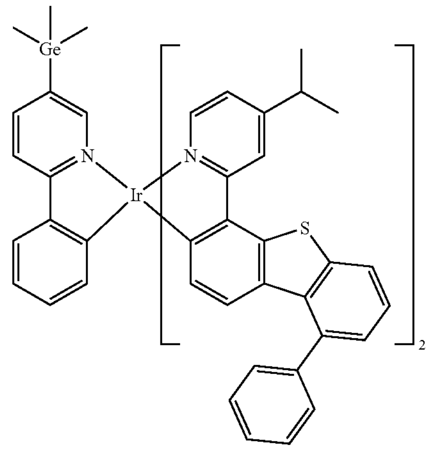
4444
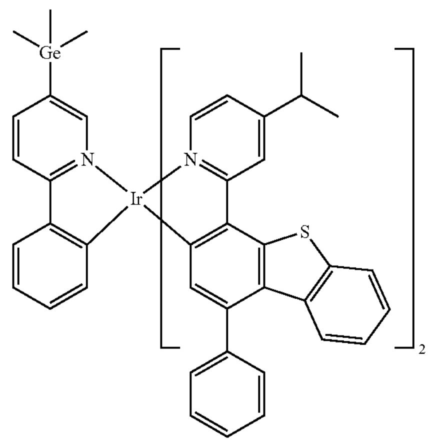
4445
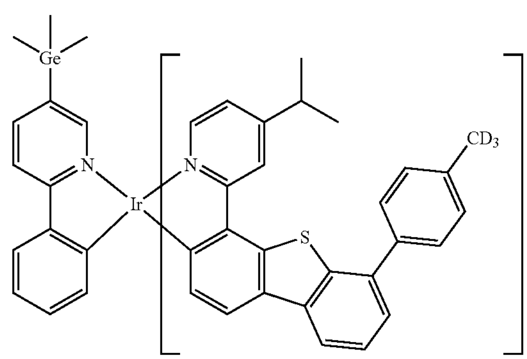
4446
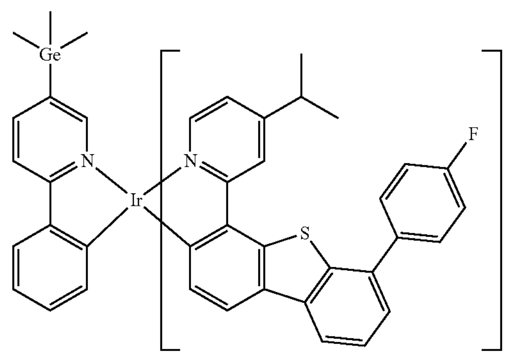

-continued
4447
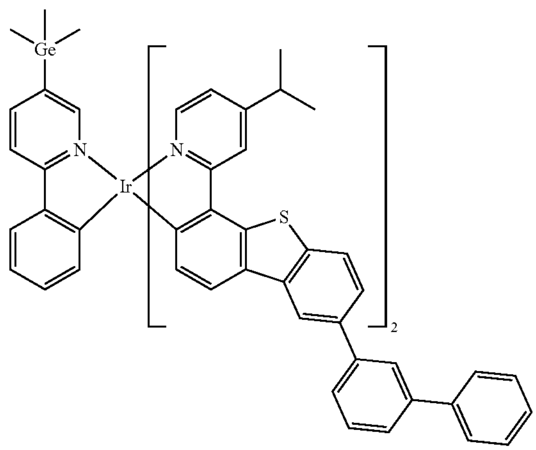
4448
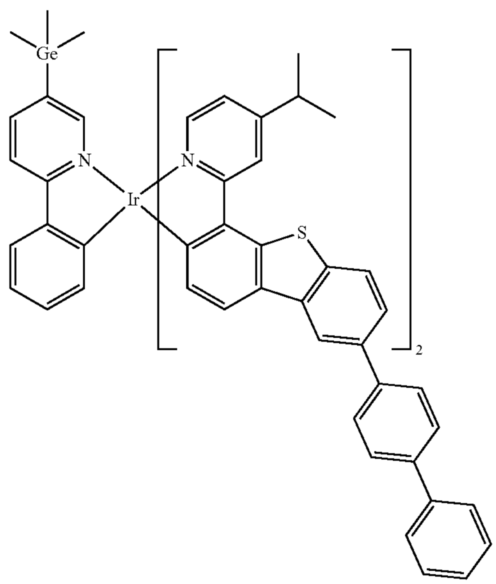
4449
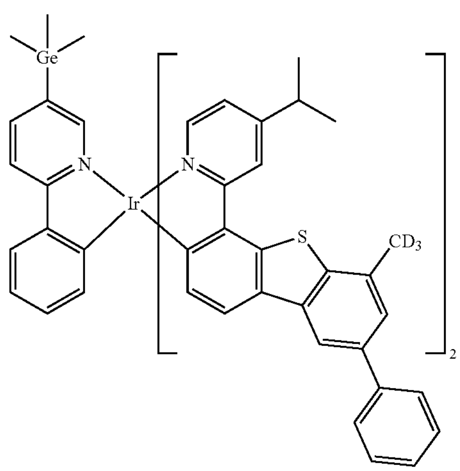
-continued
4450
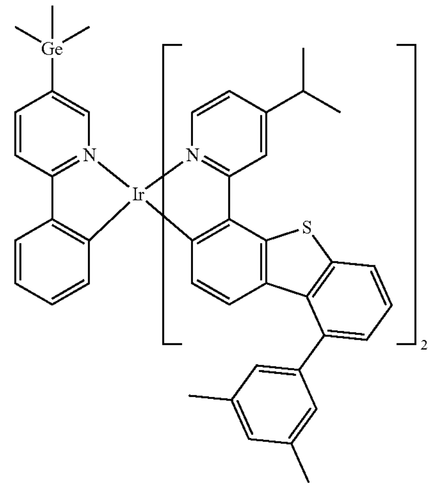
4451
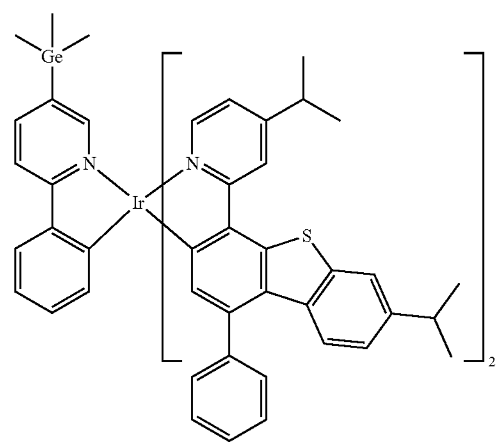
4452
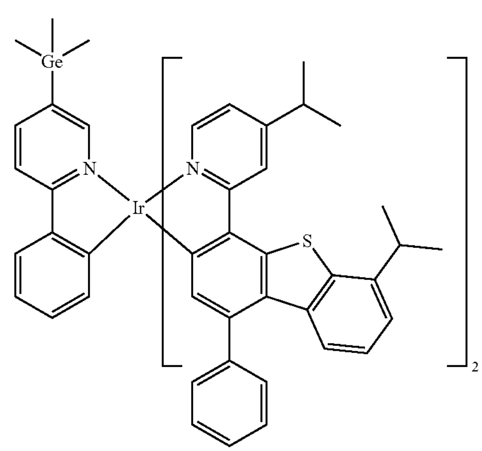

-continued
4453
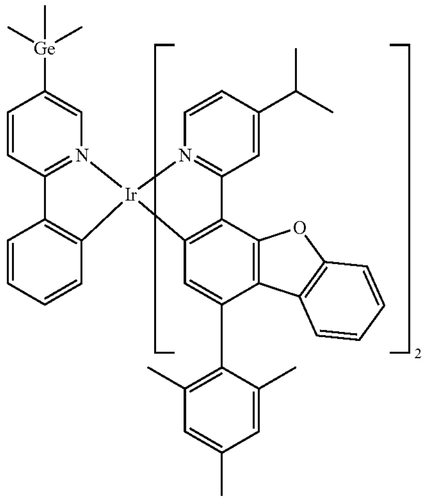
4454
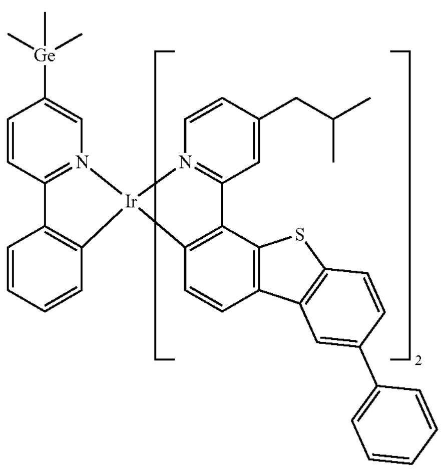
4455
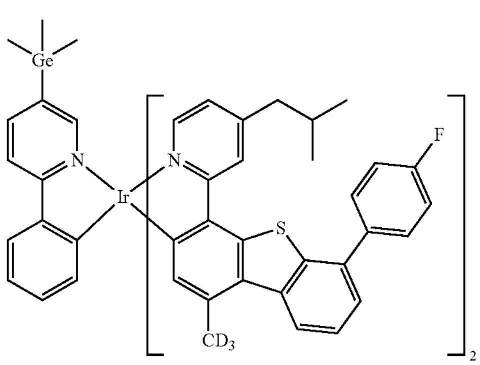
-continued
4456
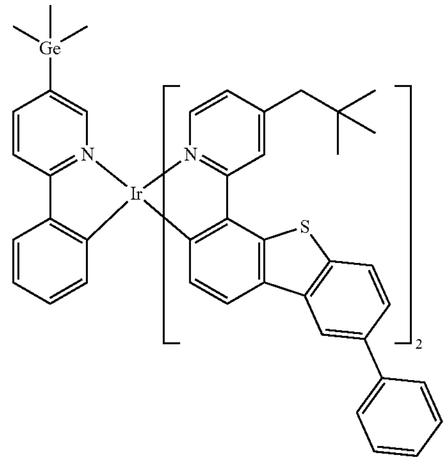
4457
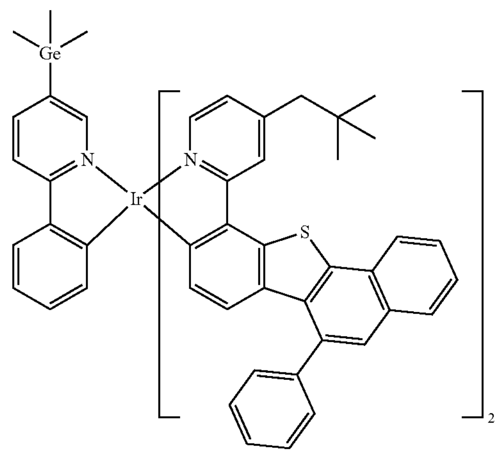
4458
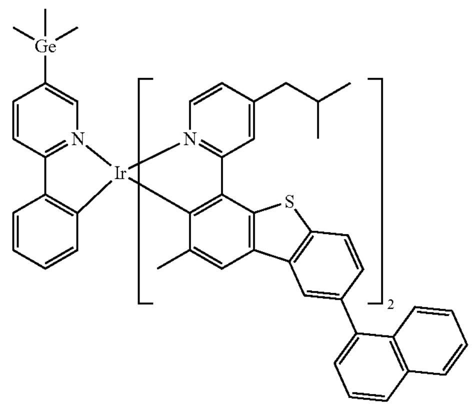

-continued
4459
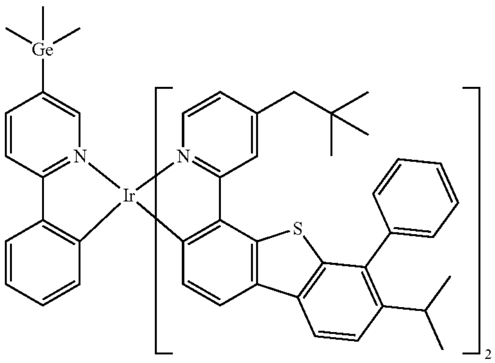
4460
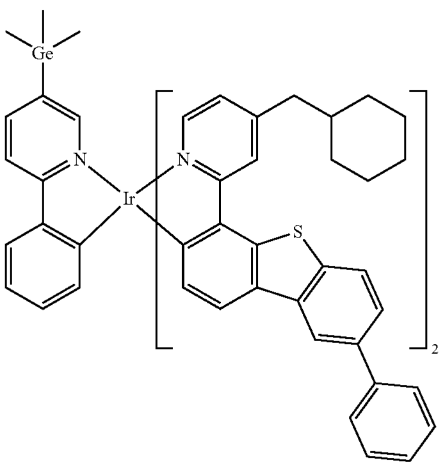
4461
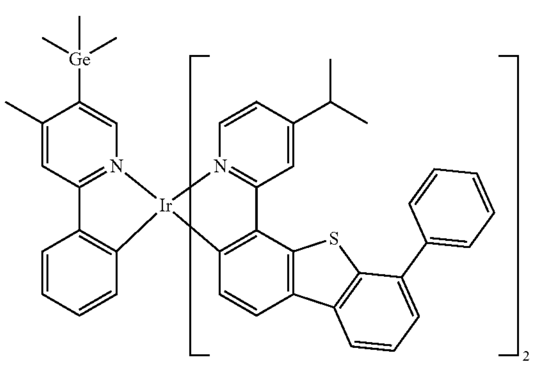
-continued
4462
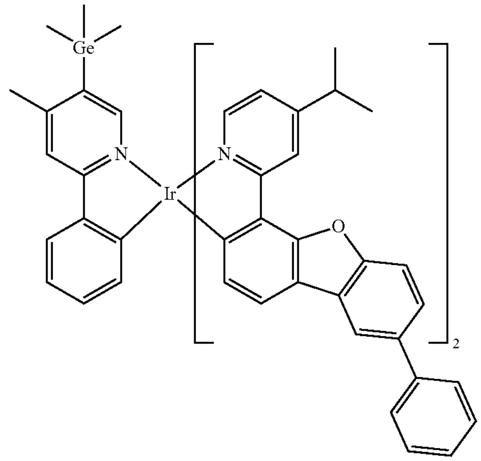
4463
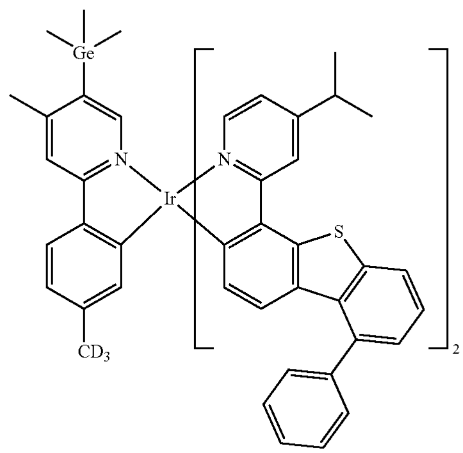
4464
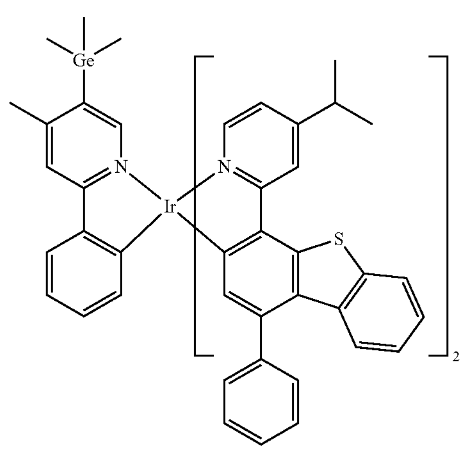

4465
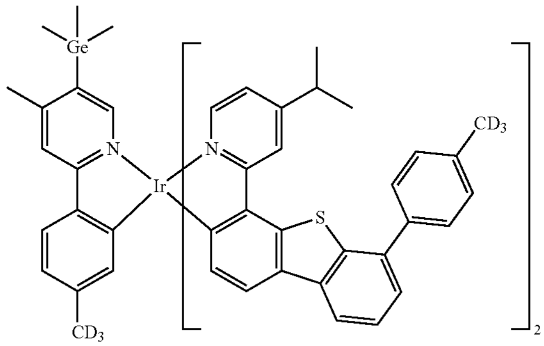
4466
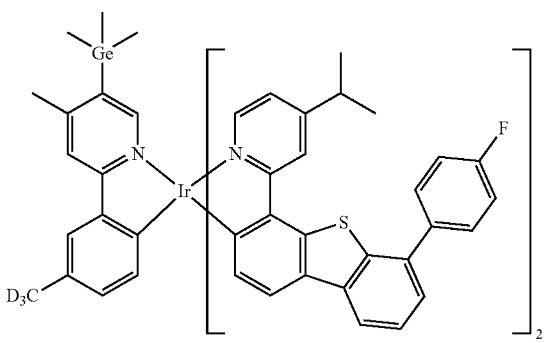
4467
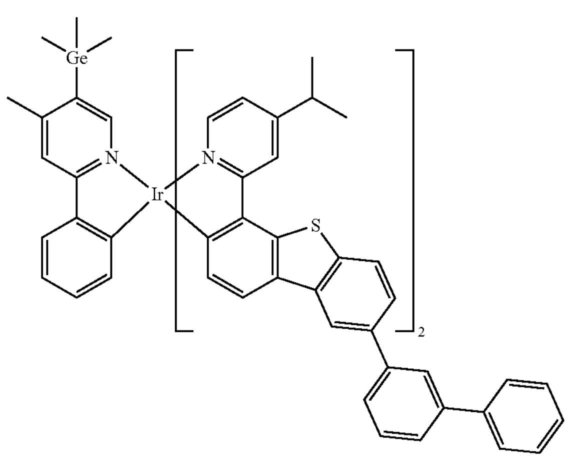
4468
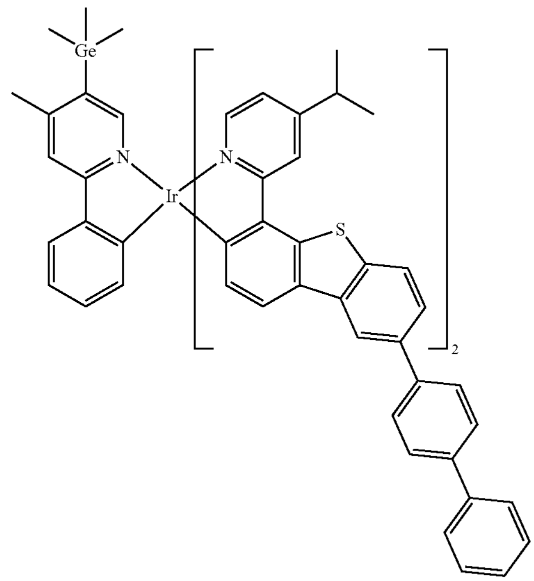
4469
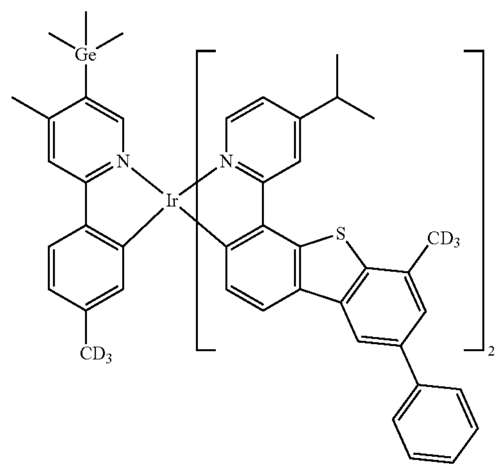
4470
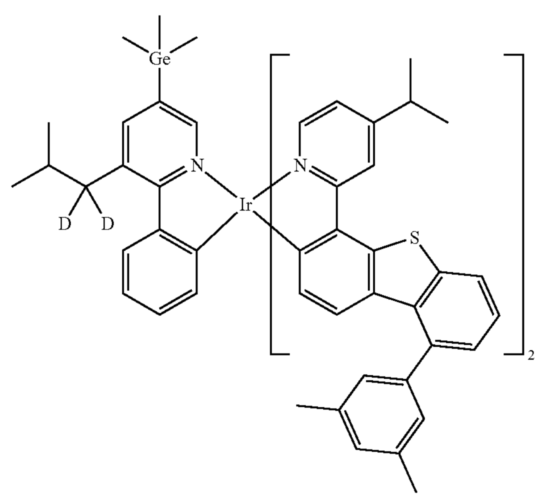

-continued
4471
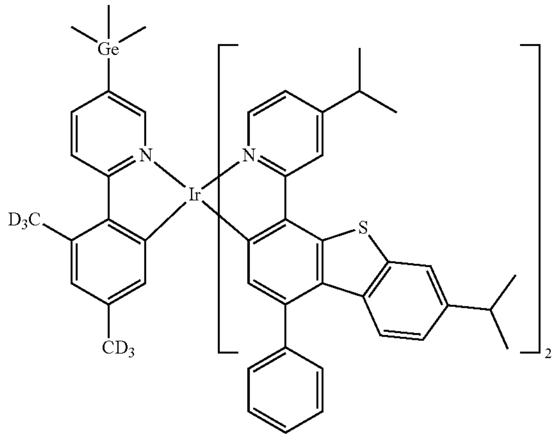
4472
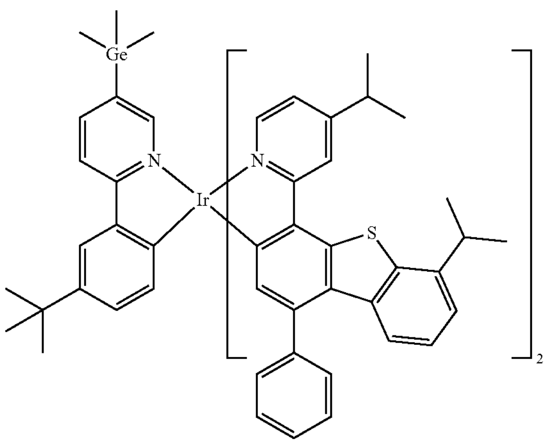
4473
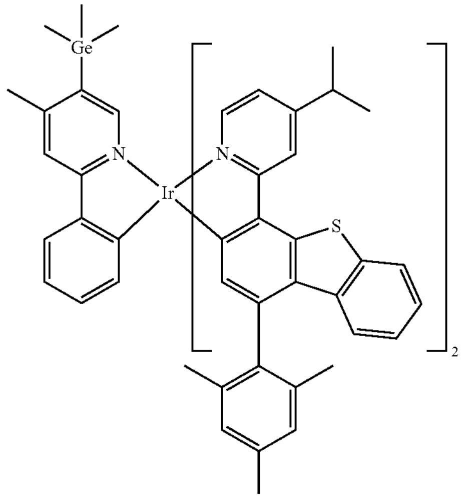
-continued
4474
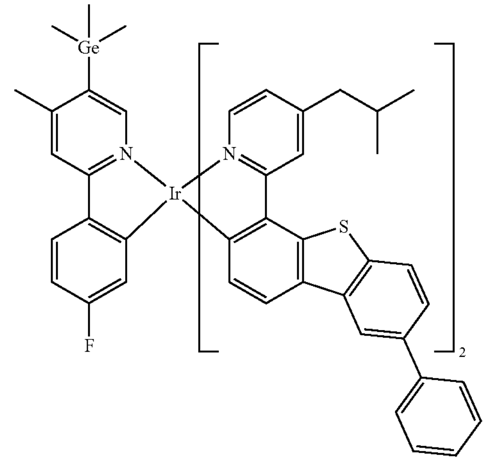
4475
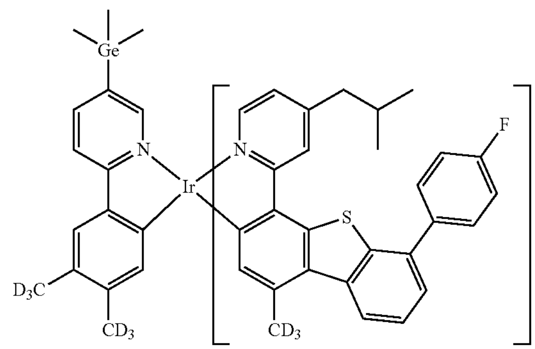
4476
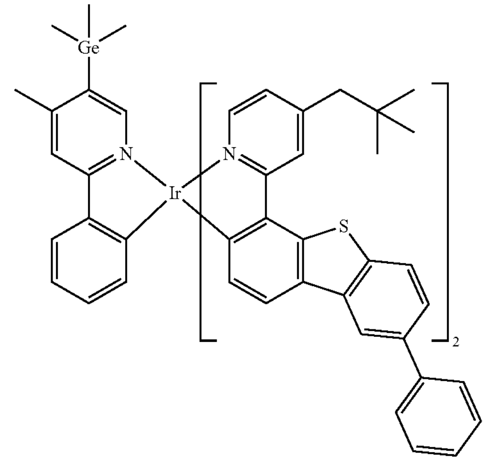

-continued
4477
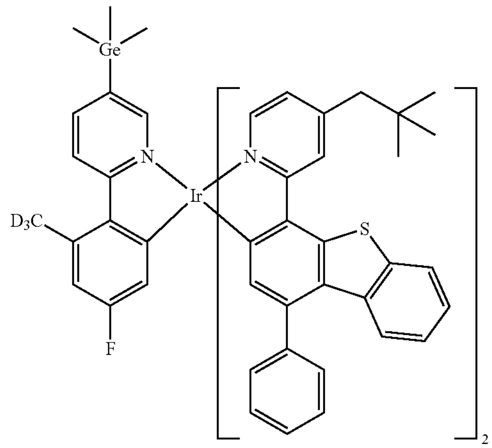
4478
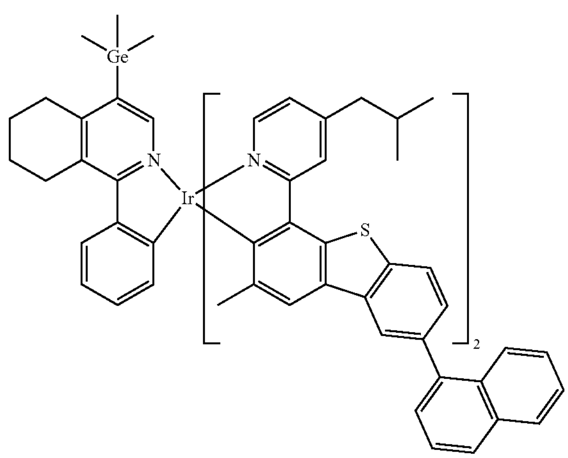
4479
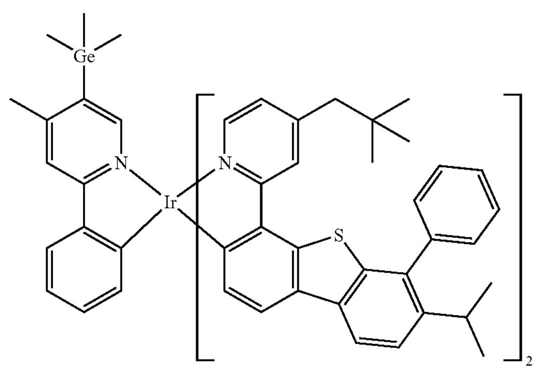
-continued
4480
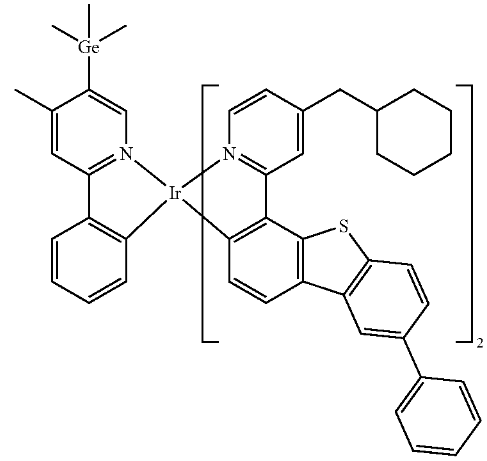
4481
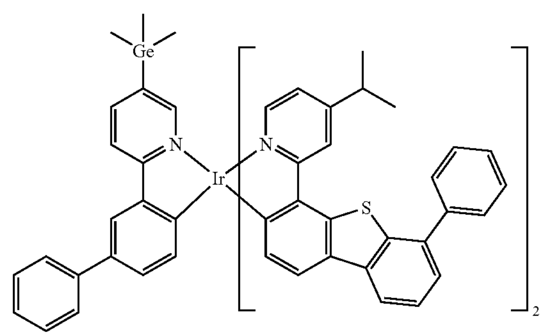
4482
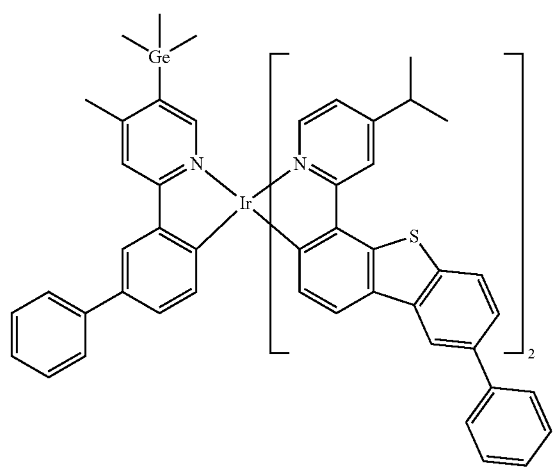

-continued
4483
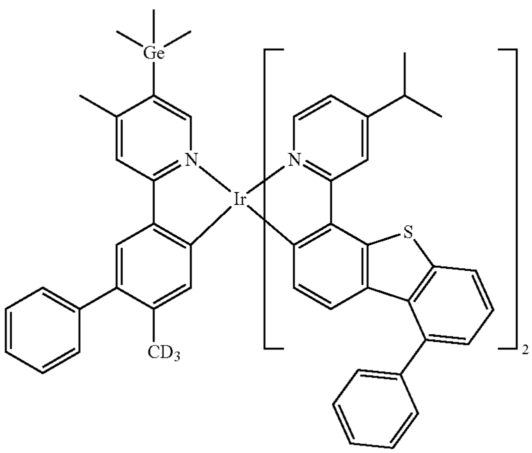
4484
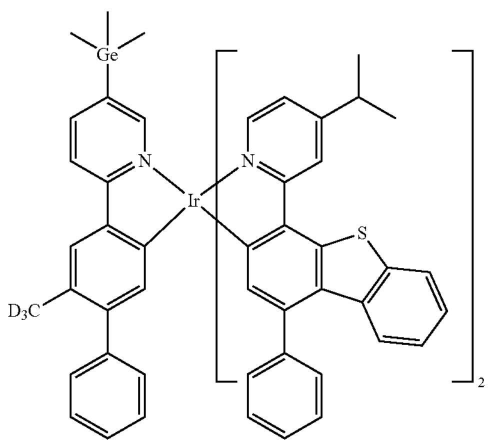
4485
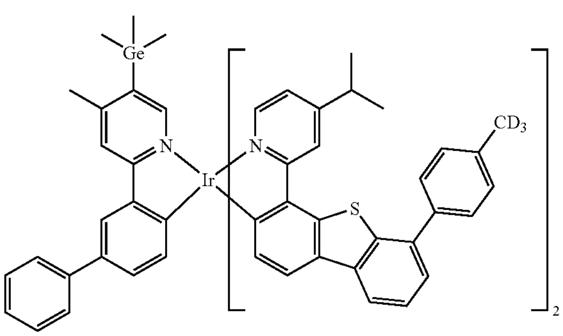
4486
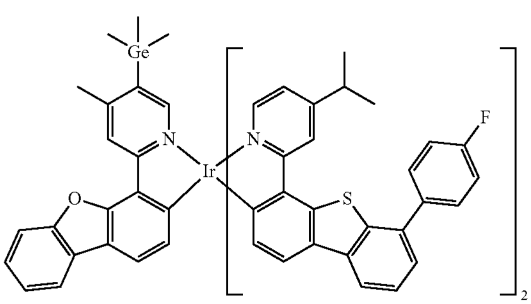
-continued
4487
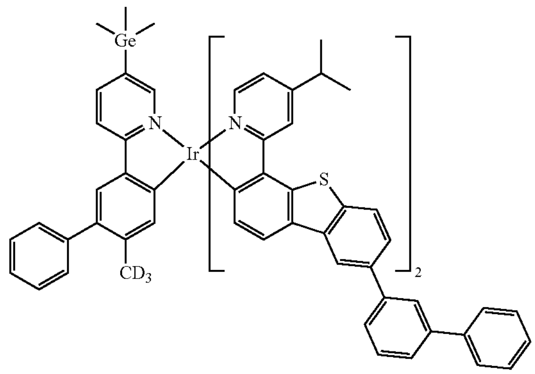
4488
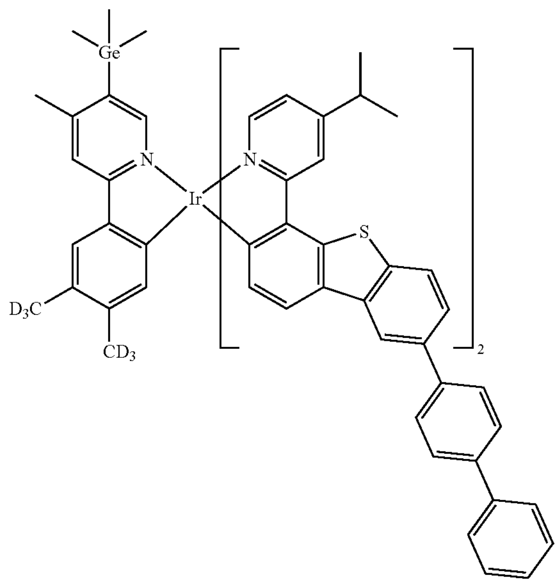
4489
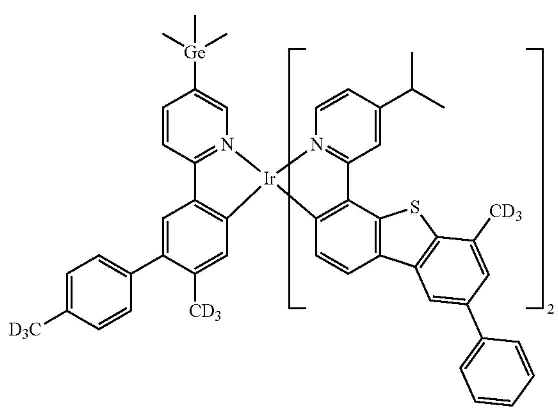

-continued
4490
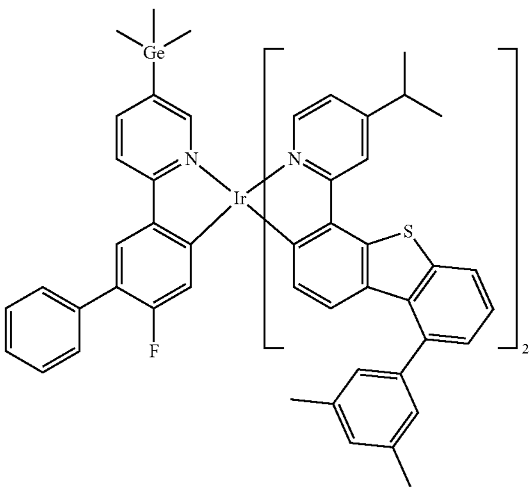
4491
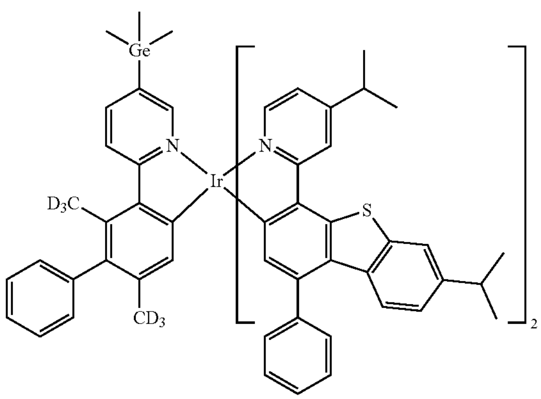
4492
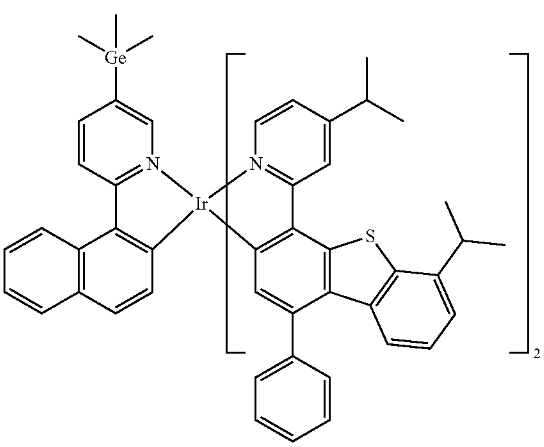
-continued
4493
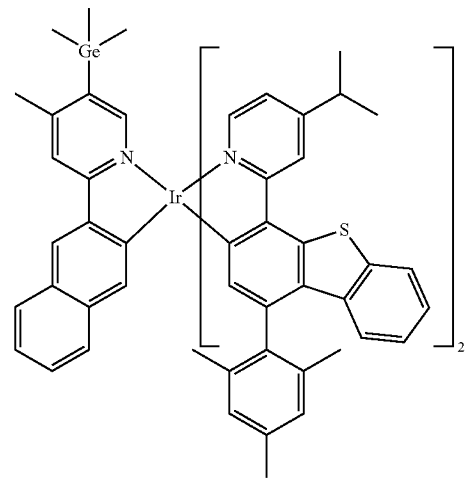
4494
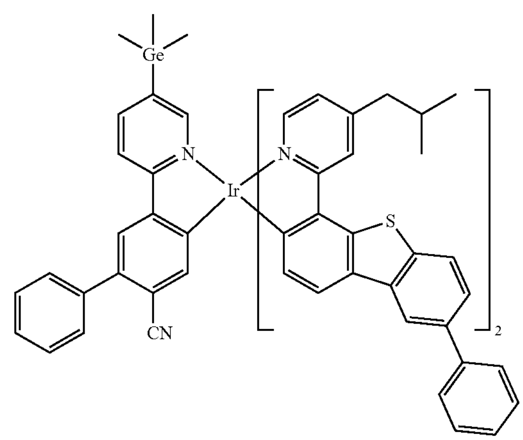
4495
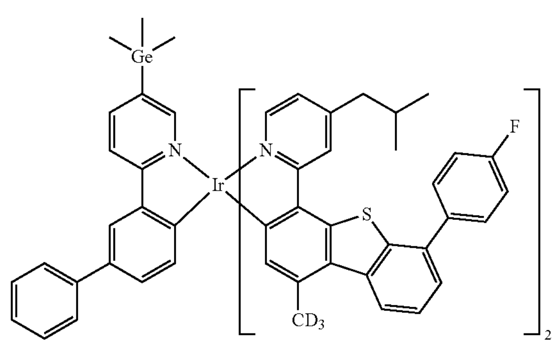

-continued
4496
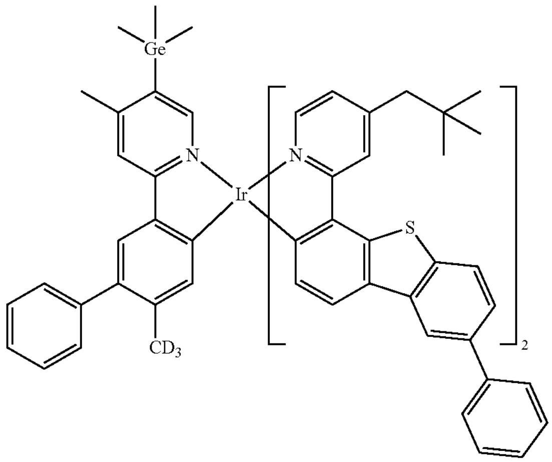
4497
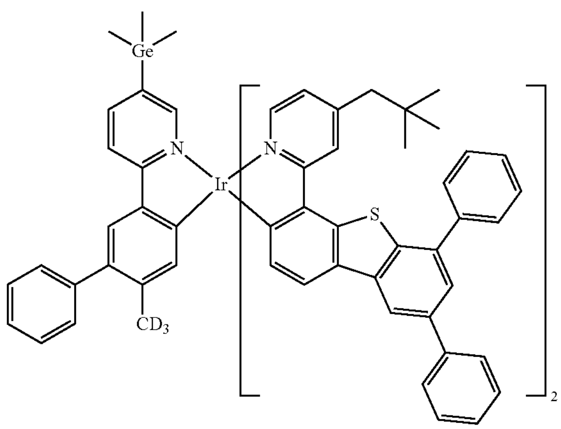
4498
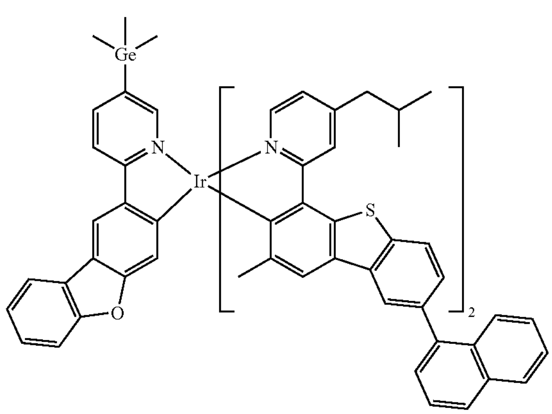
-continued
4499
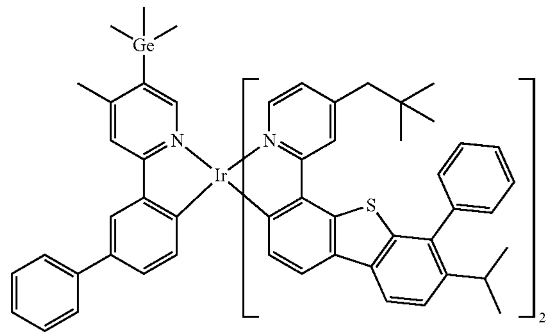
4500
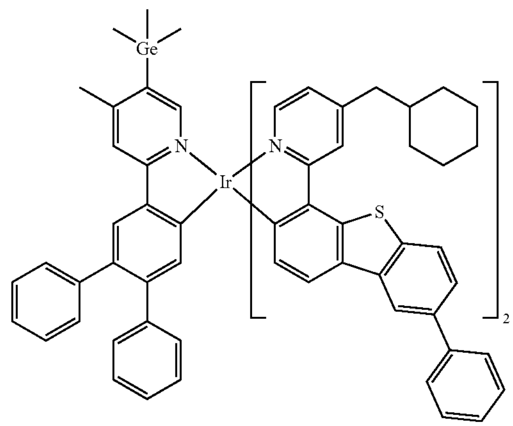
4501
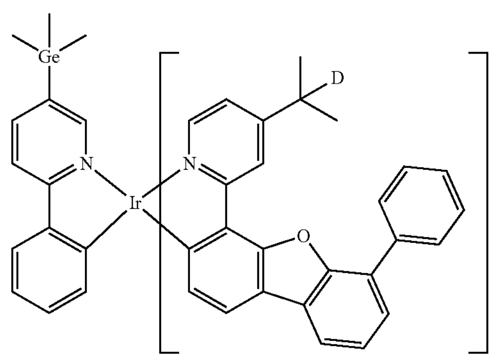
4502
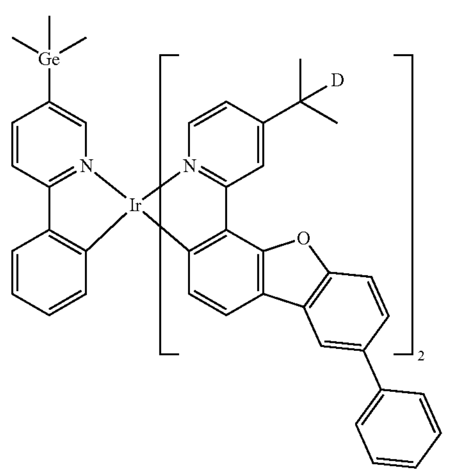

4503
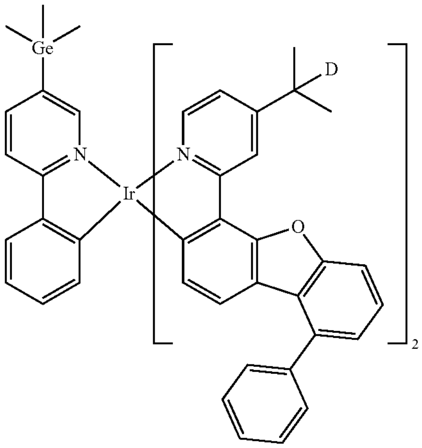
4504
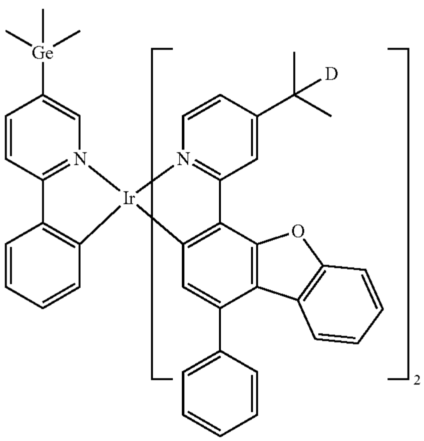
4505
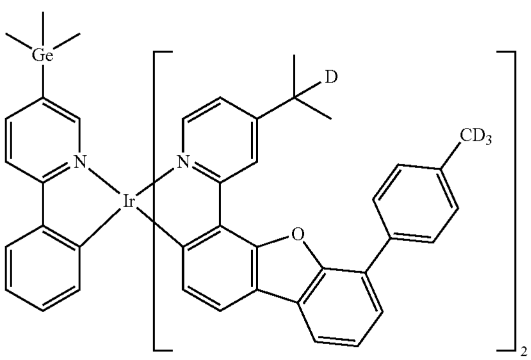
4506
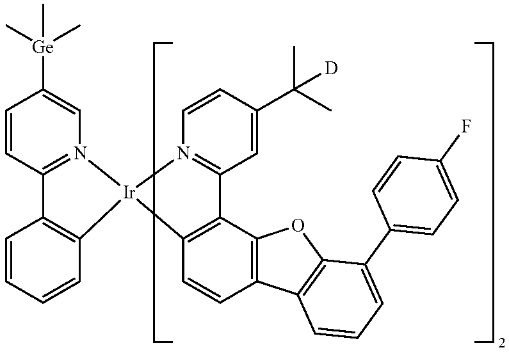
4507
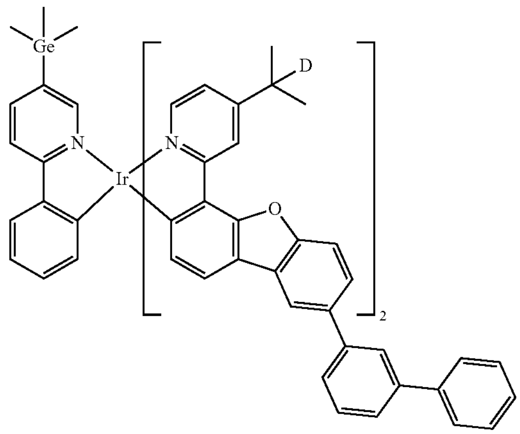
4508
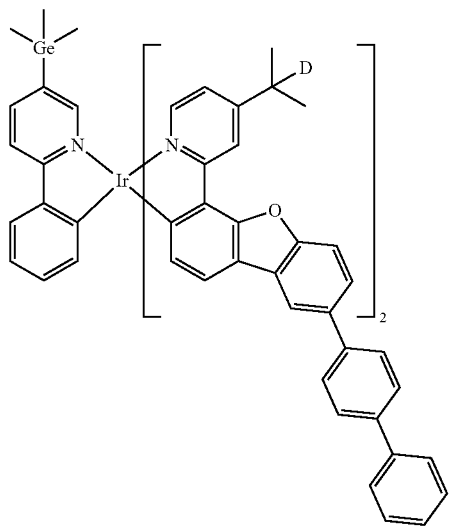
4509
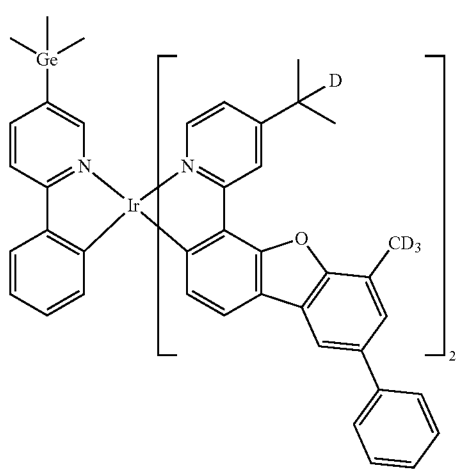

-continued
4510
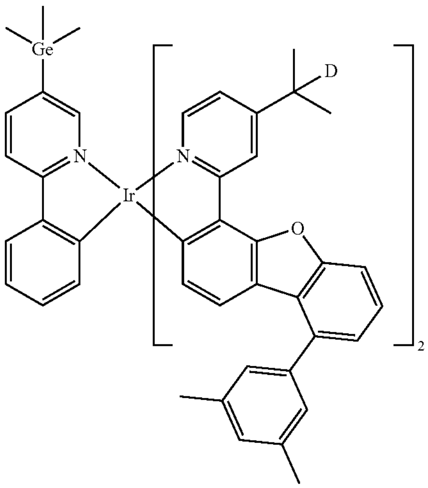
4511
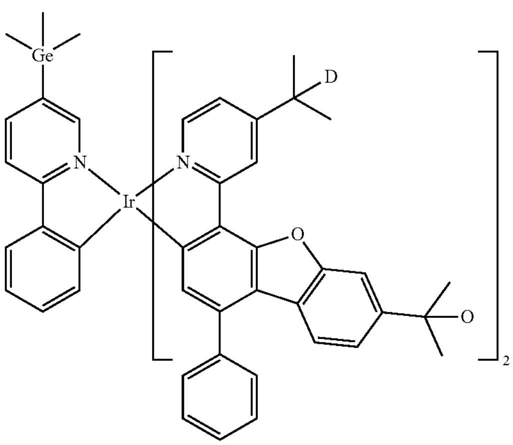
4512
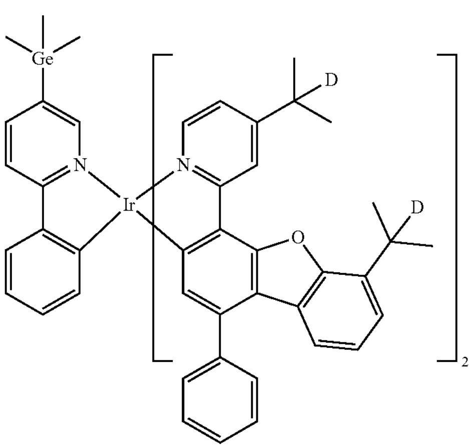
-continued
4513
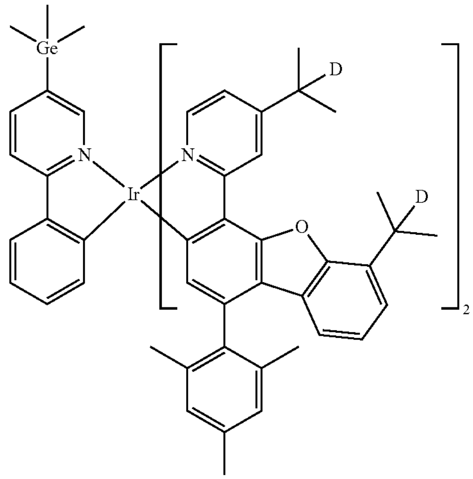
4514
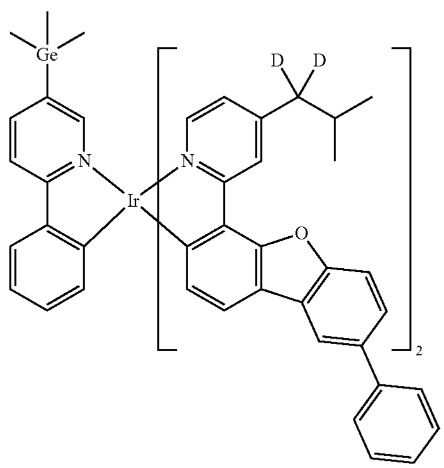
4515
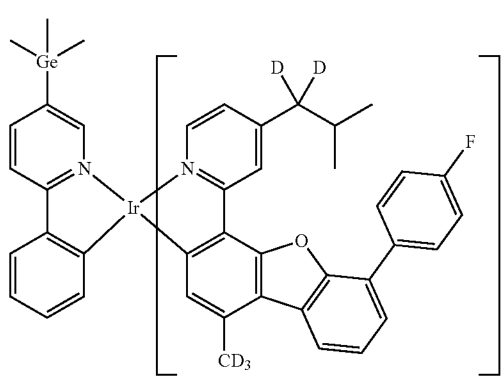

-continued
4516
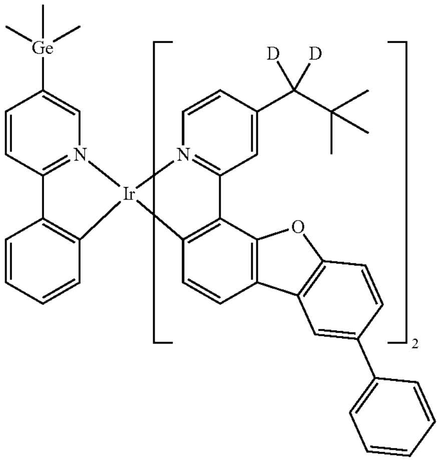
4517
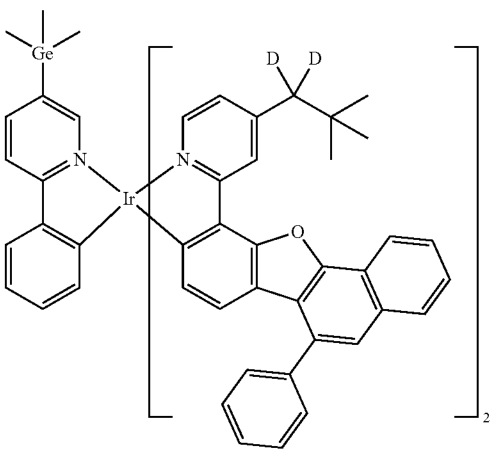
4518
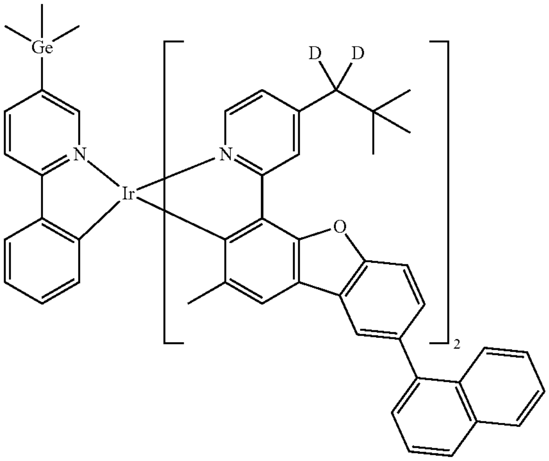
-continued
4519
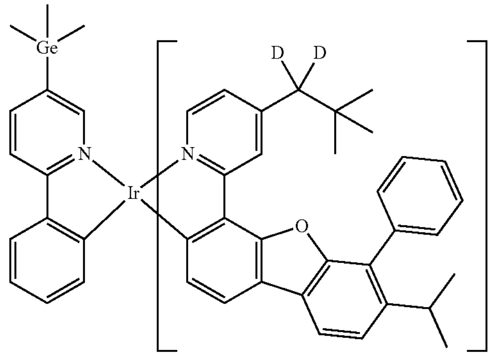
4520
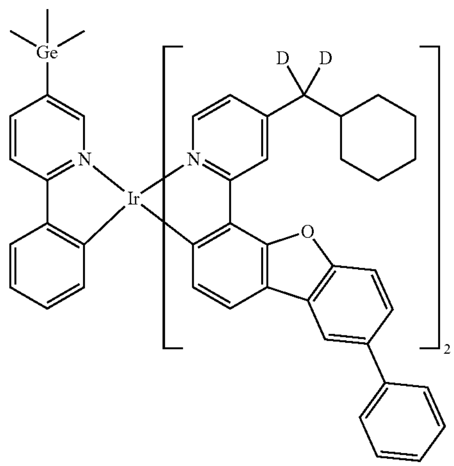
4521
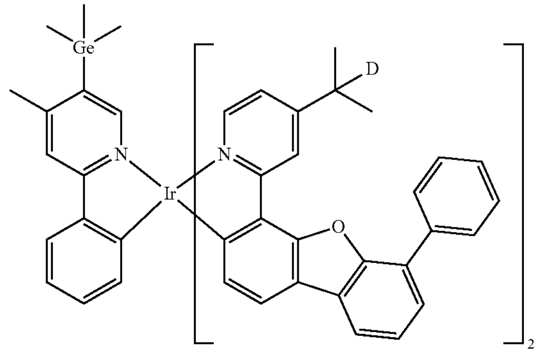

4522
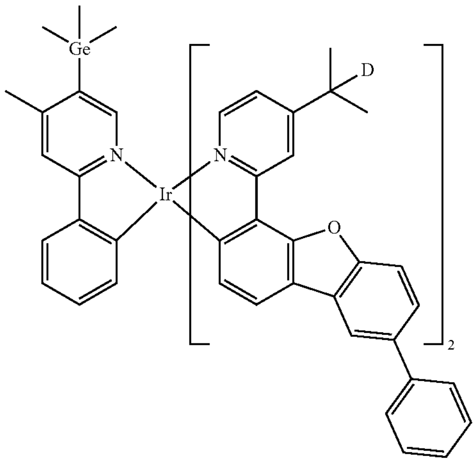
4523
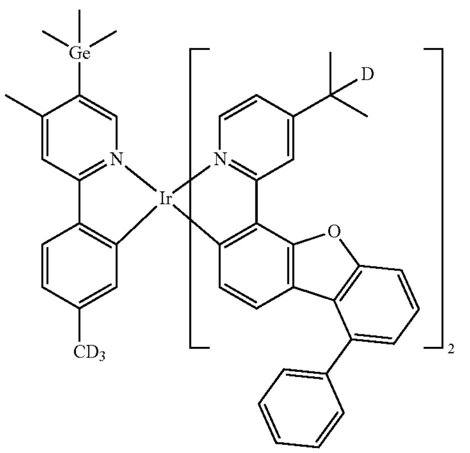
4524
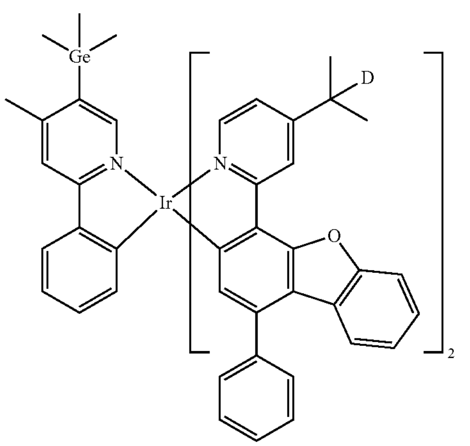
4525
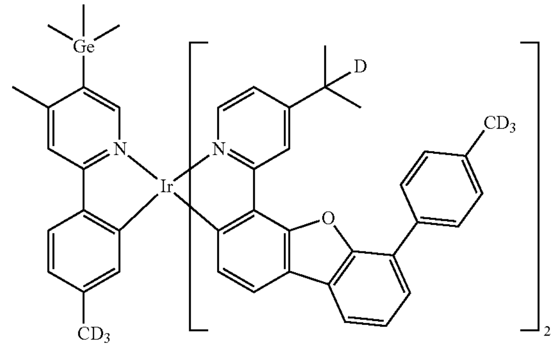
4526
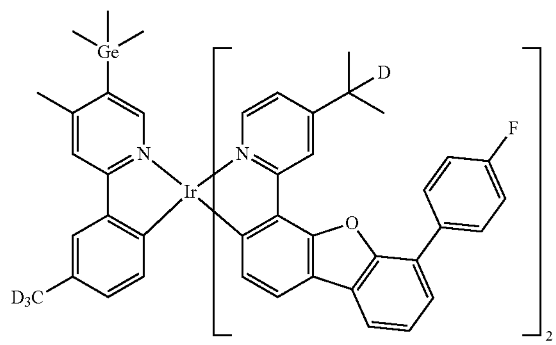
4527
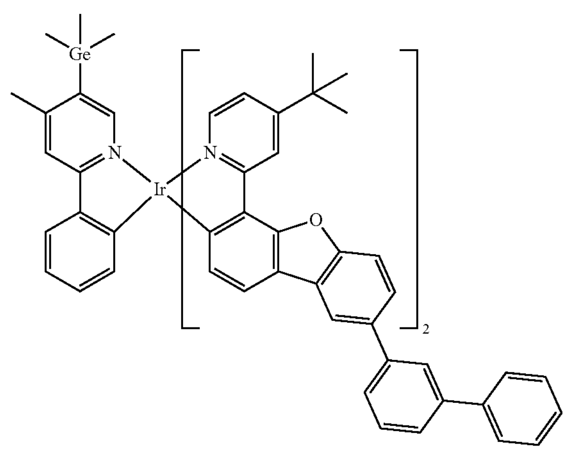

-continued
4528
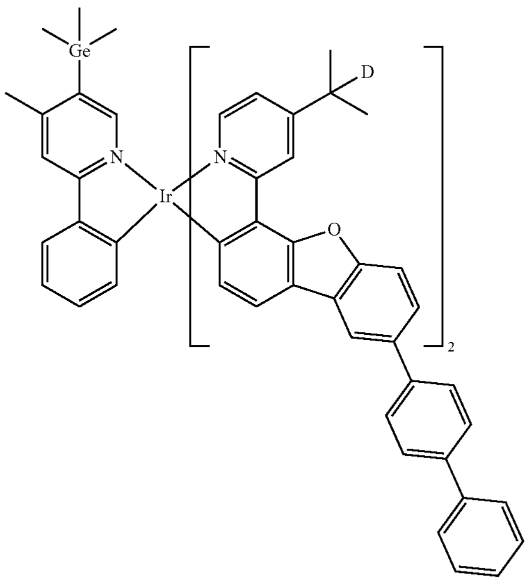
4529
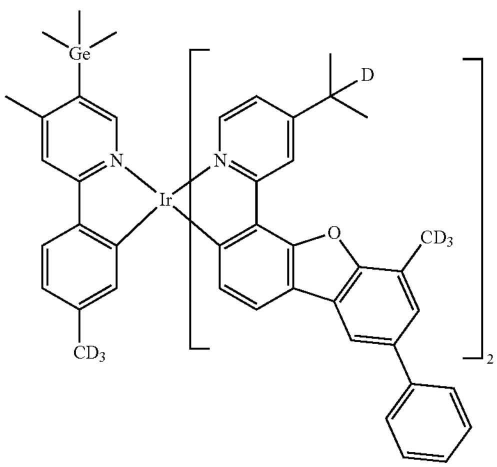
4530
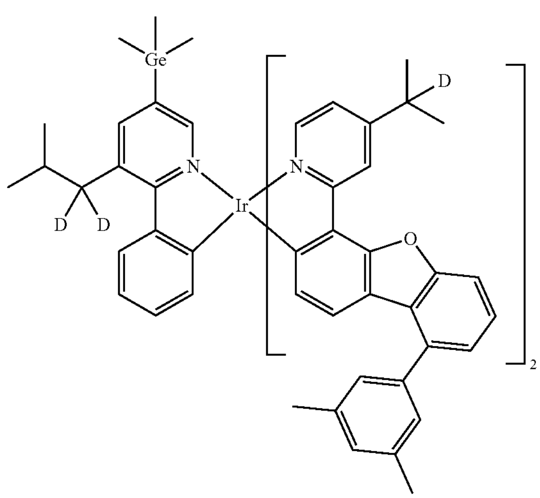
-continued
4531
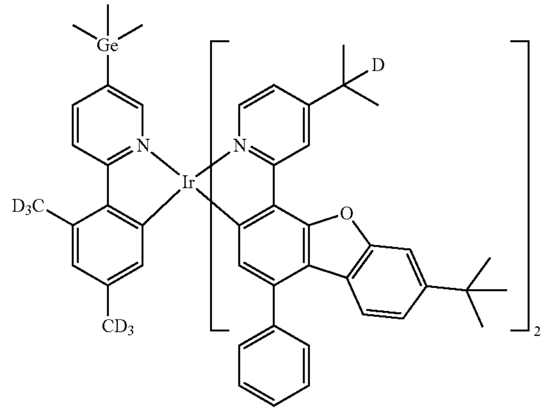
4532
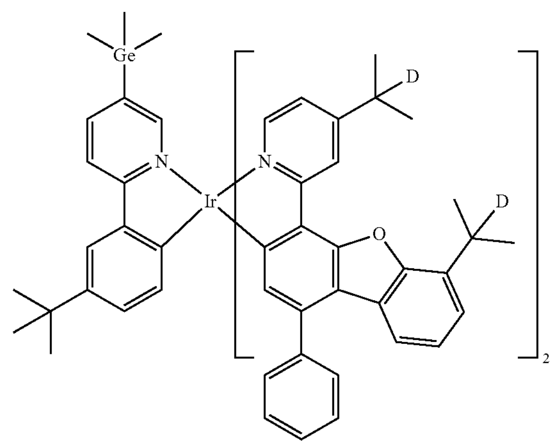
4533
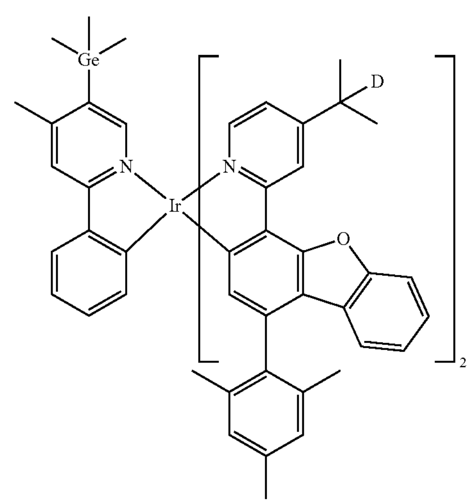

4534
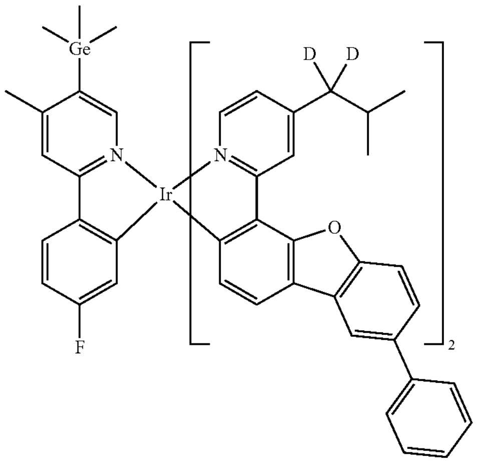
4535
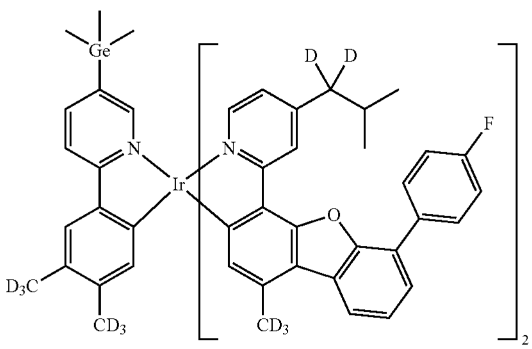
4536
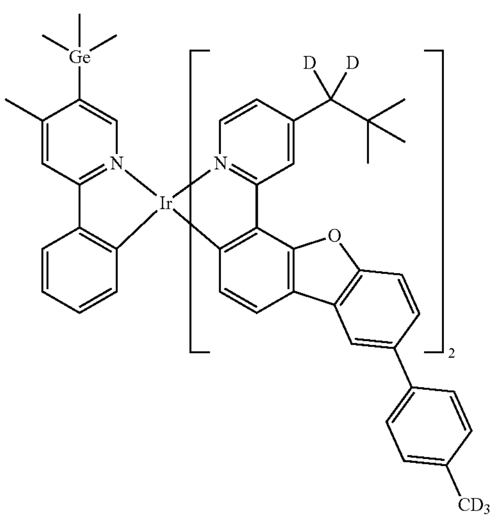
4537
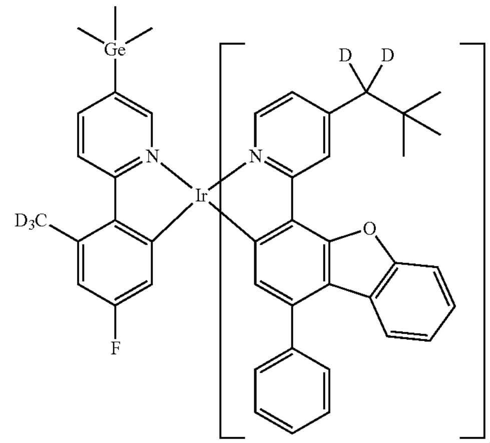
4538
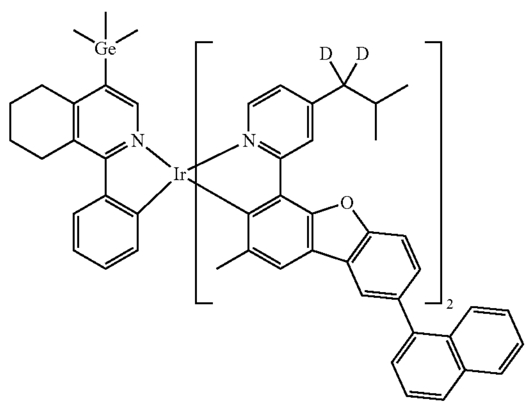
4539
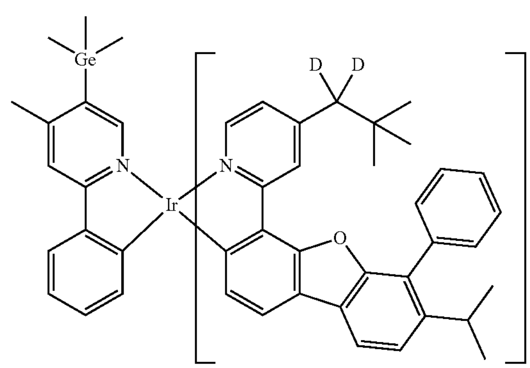

-continued
4540
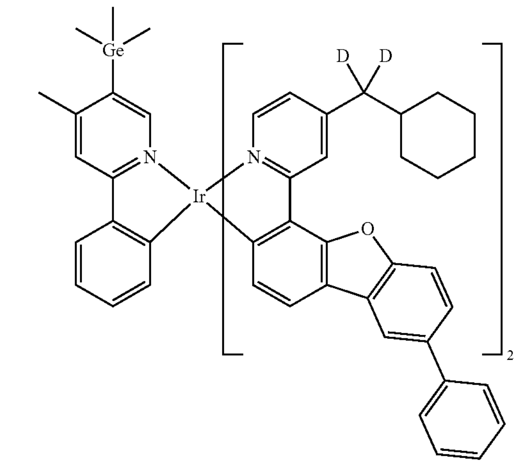
4541
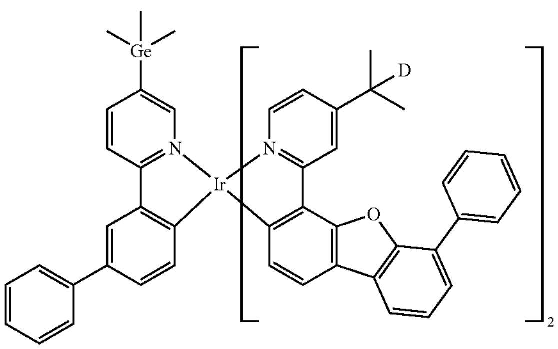
4542
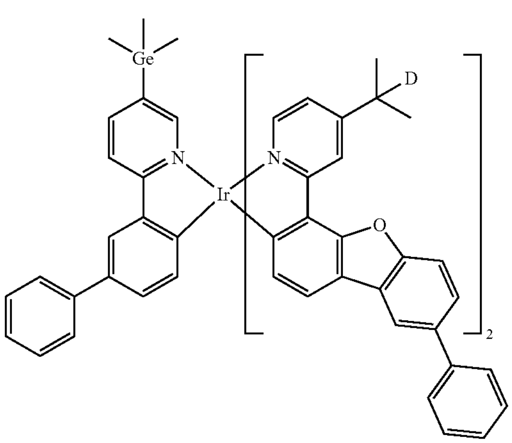
-continued
4543
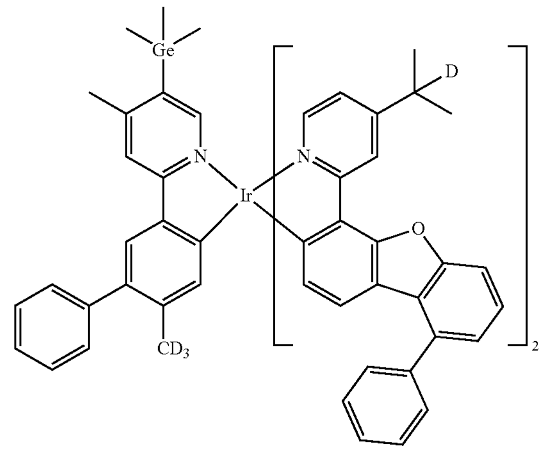
4544
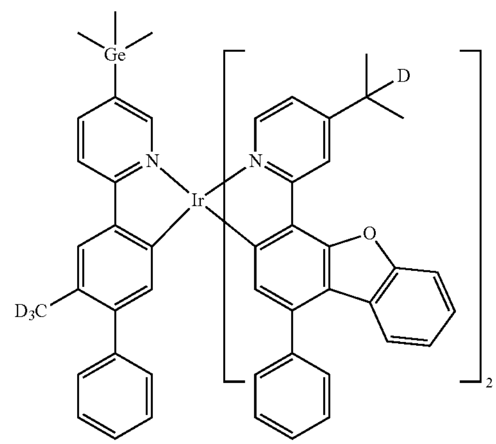
4545
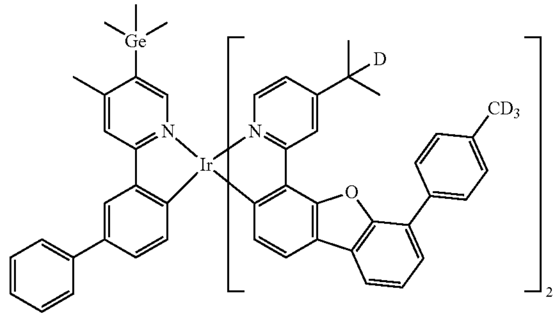
4546
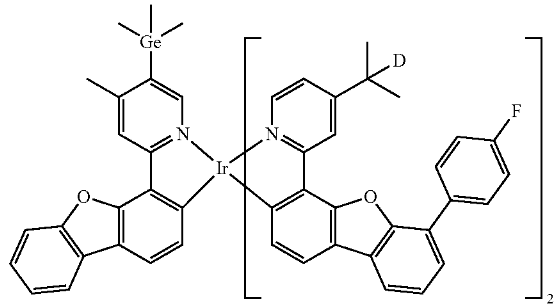

-continued
4547
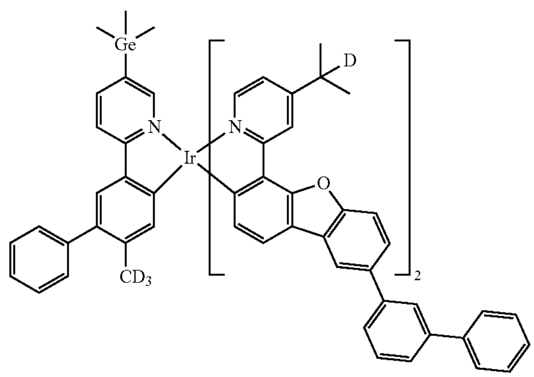
4548
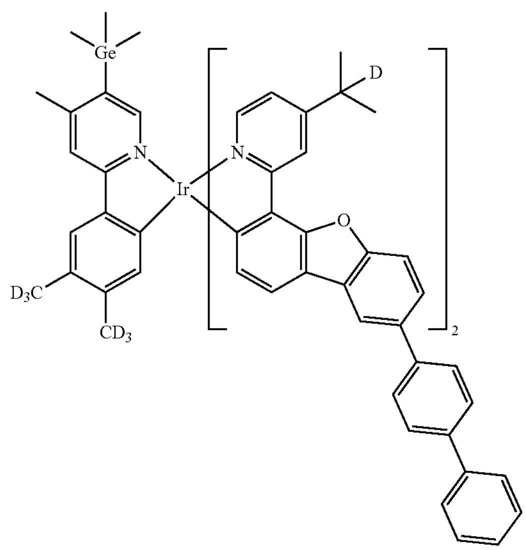
4549
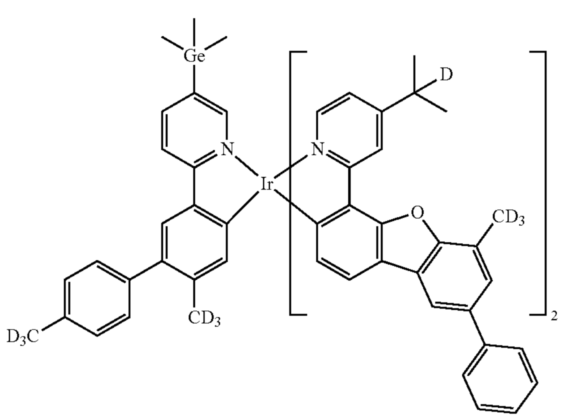
-continued
4550
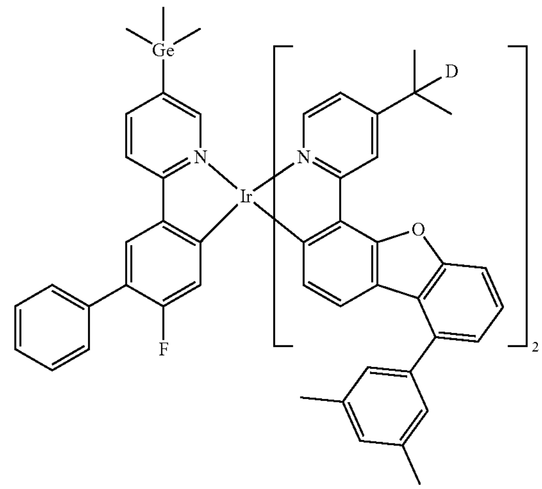
4551
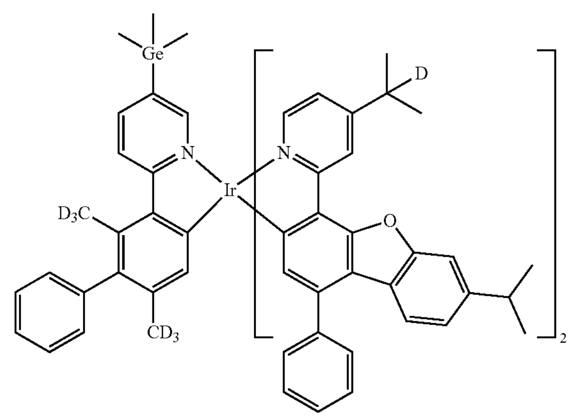
4552
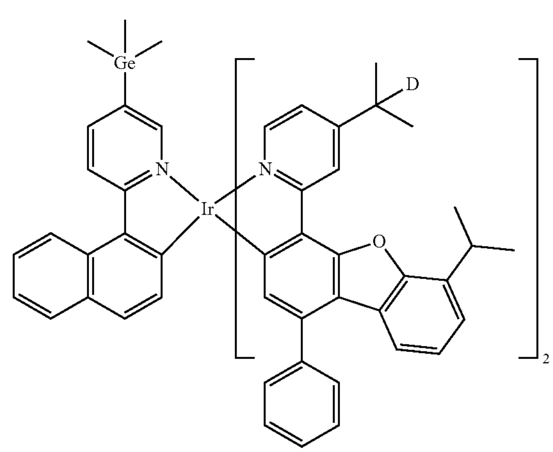

4553
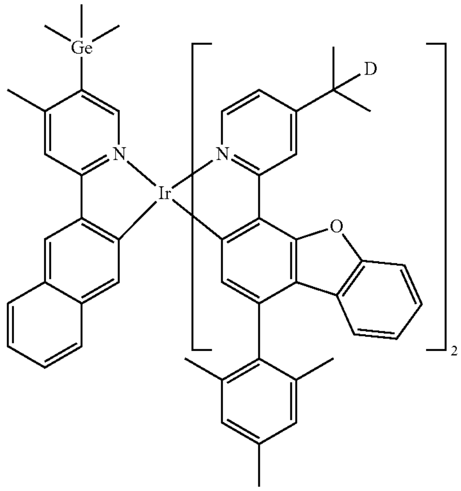
4554
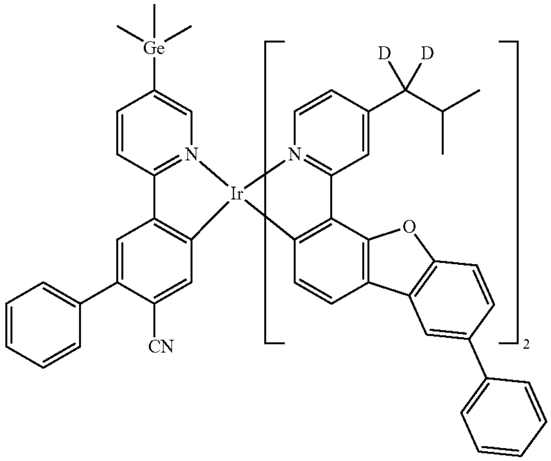
4555
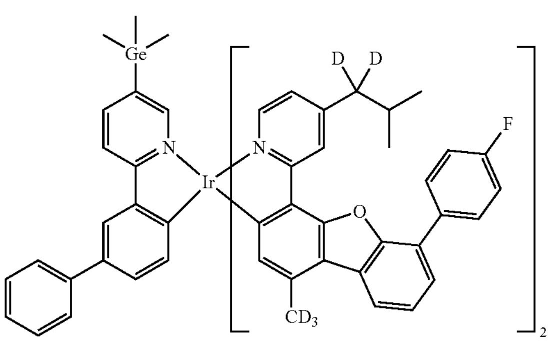
4556
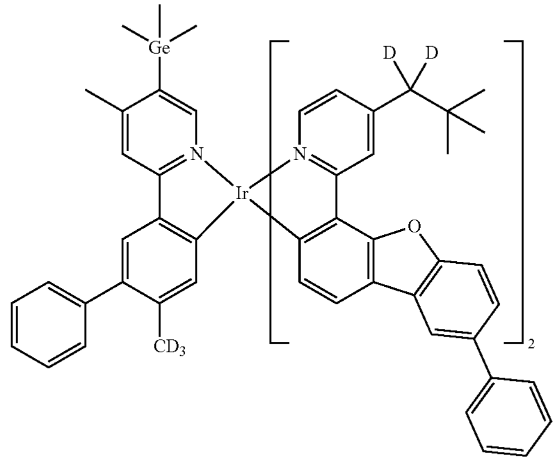
4557
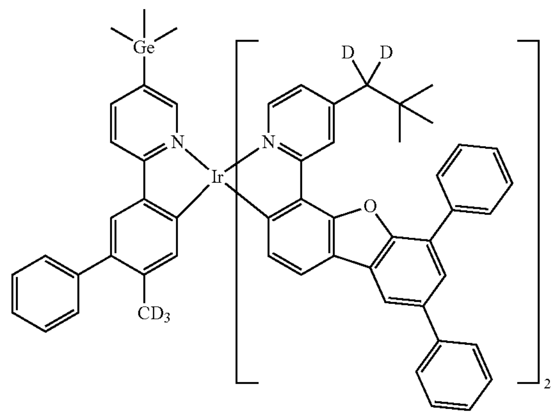
4558
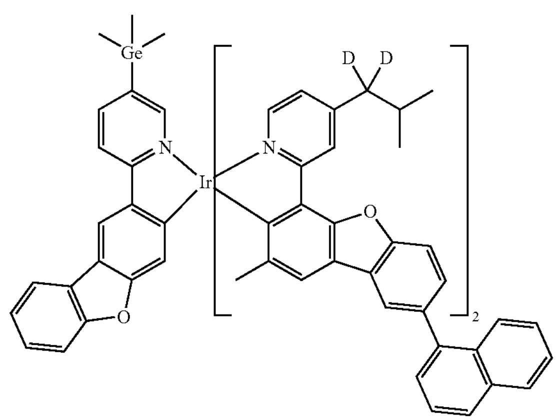

-continued
4559
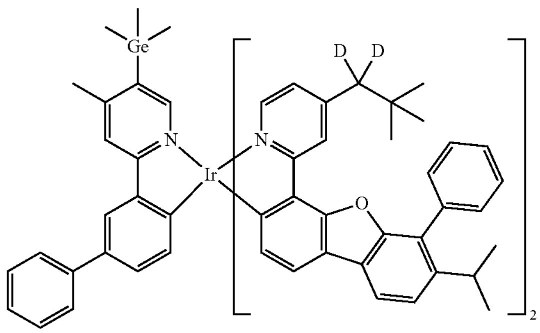
4560
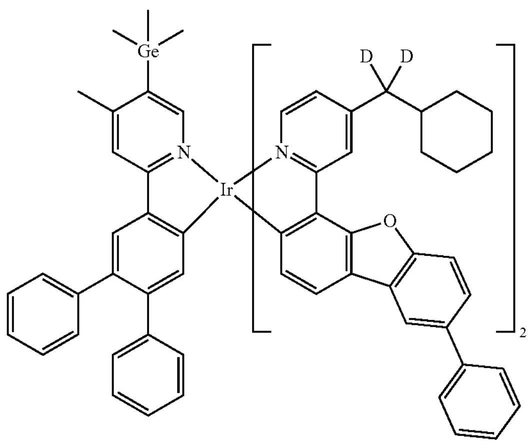
4561
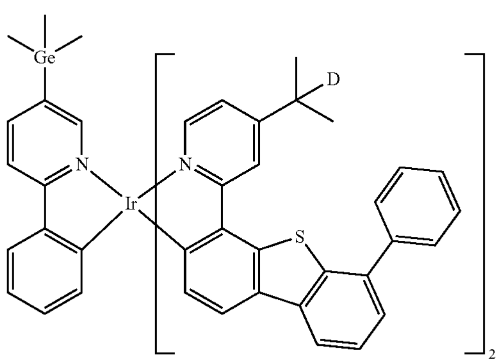
4562
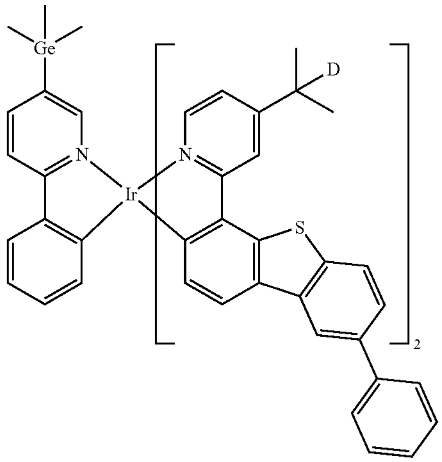
-continued
4563
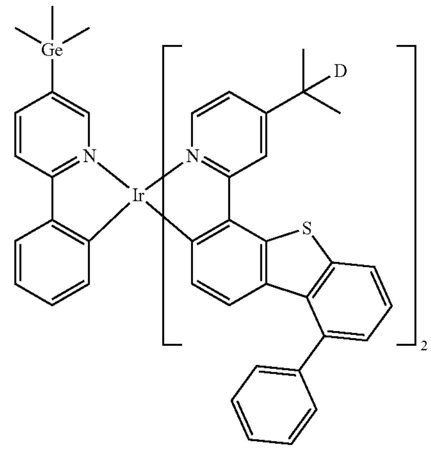
4564
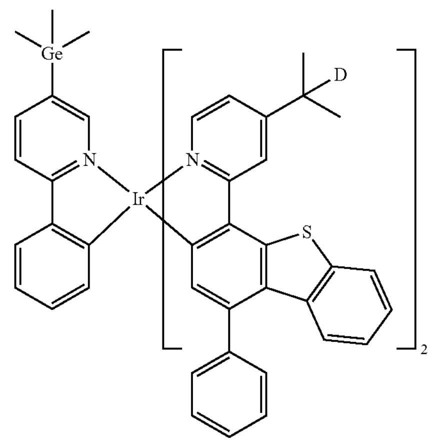
4565
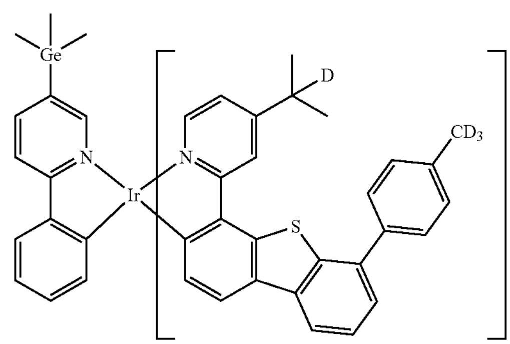
4566
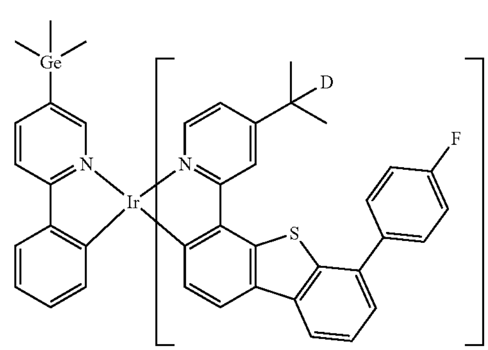

-continued
4567
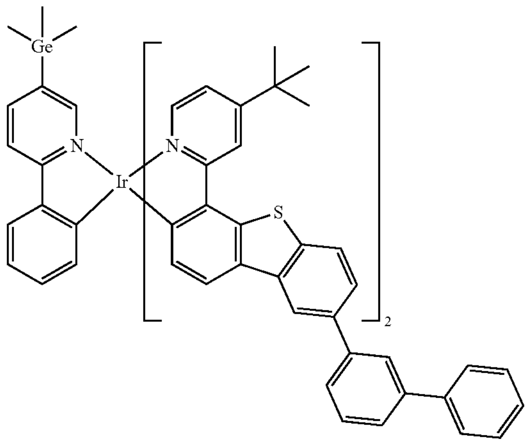
4568
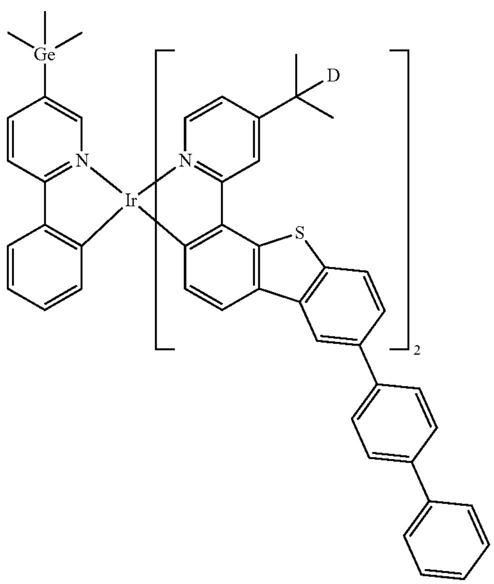
4569
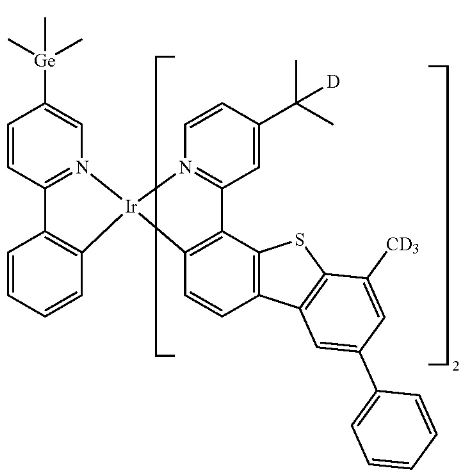
-continued
4570
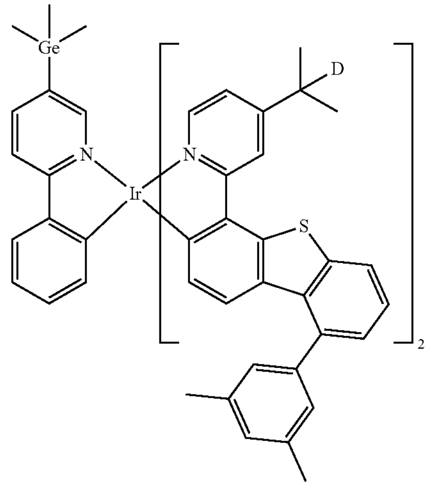
4571
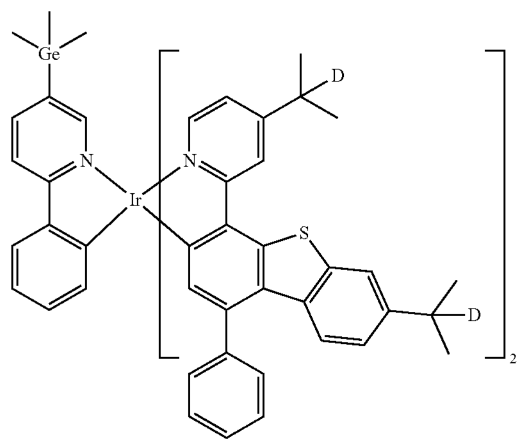
4572
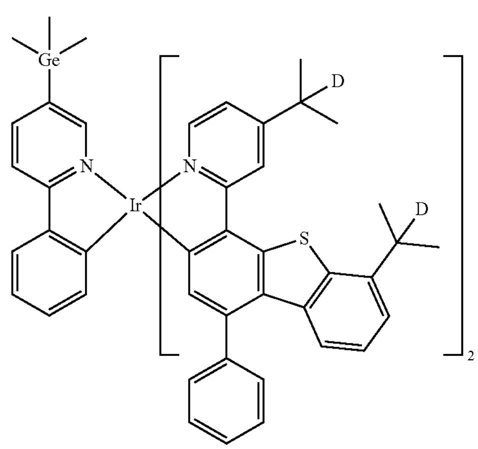

-continued
4573
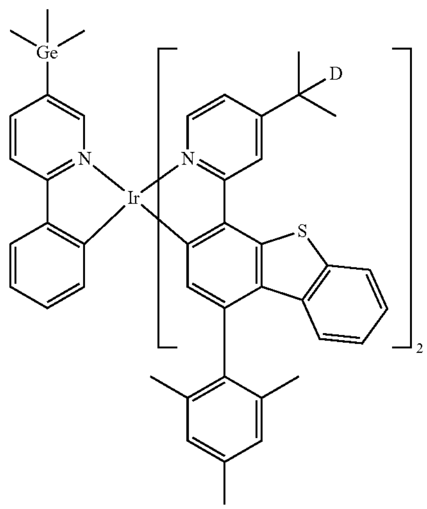
4574
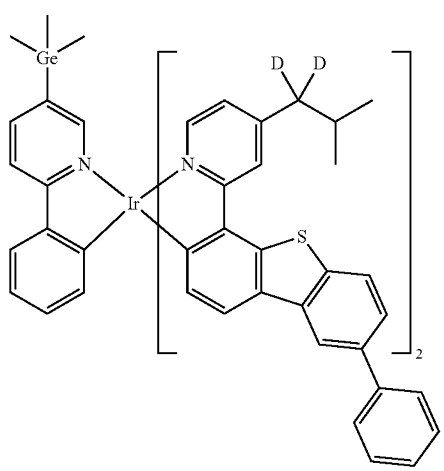
4575
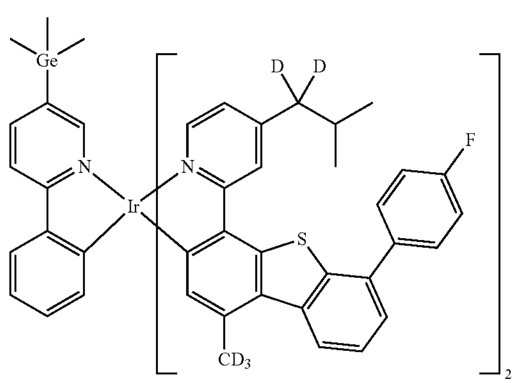
-continued
4576
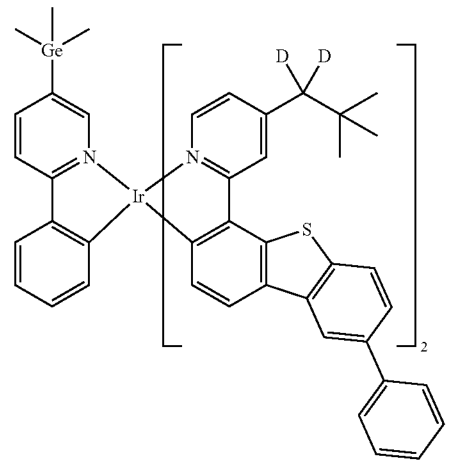
4577
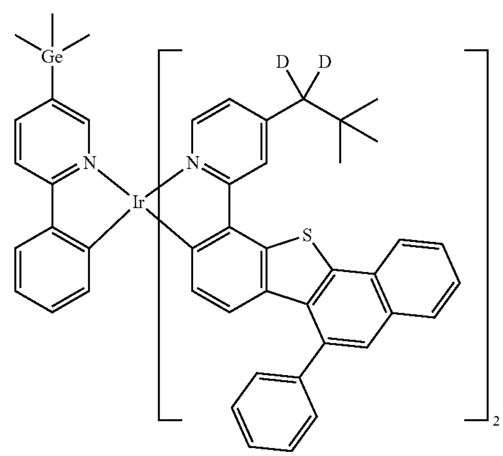
4578
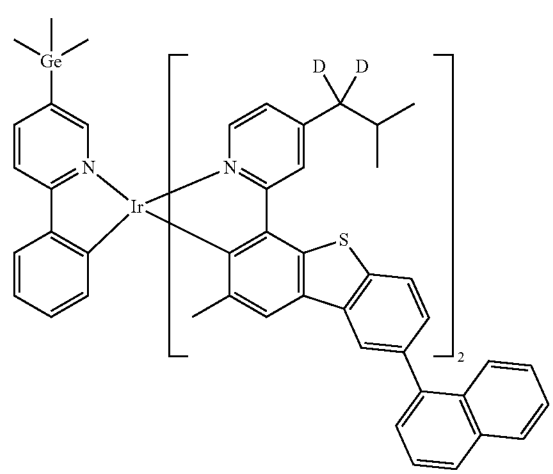

-continued
4579
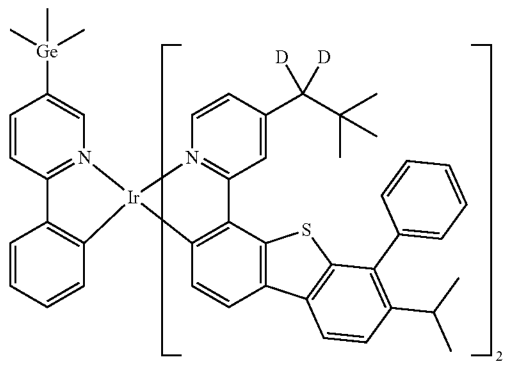
4580
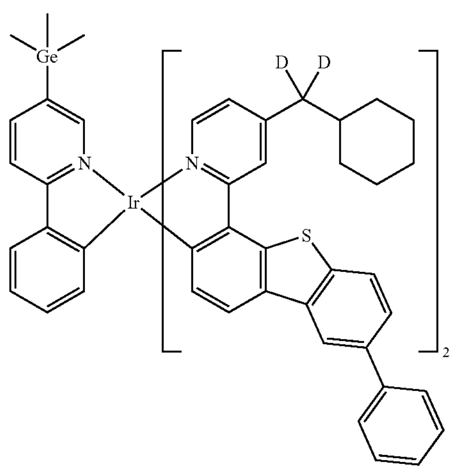
4581
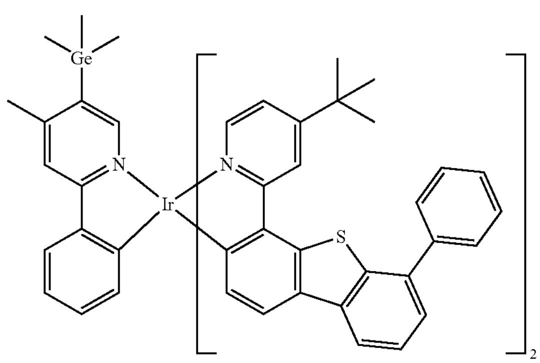
-continued
4582
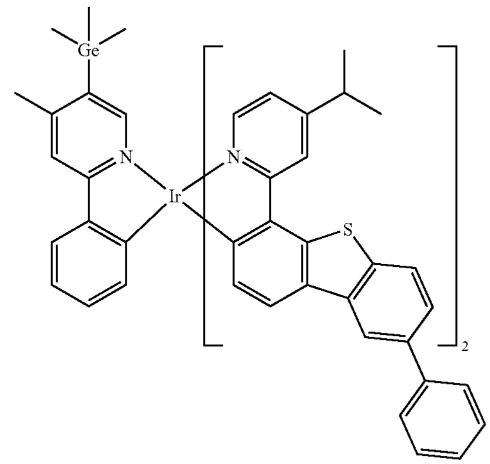
4583
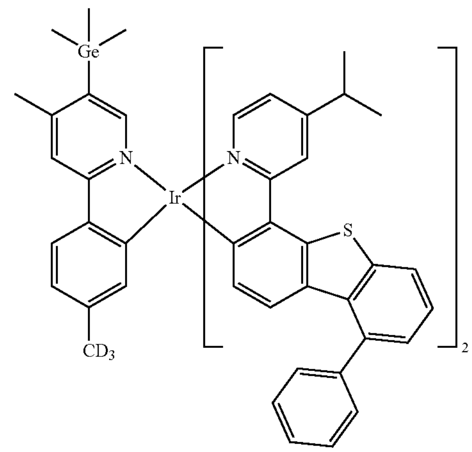
4584
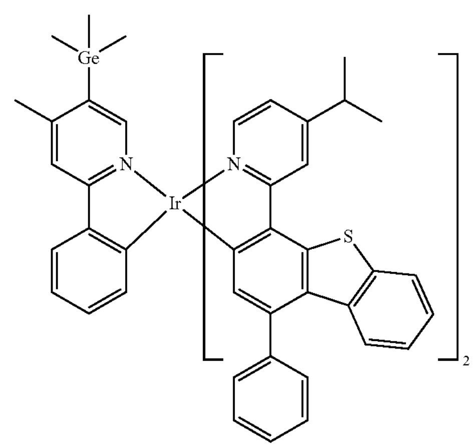

-continued
4585
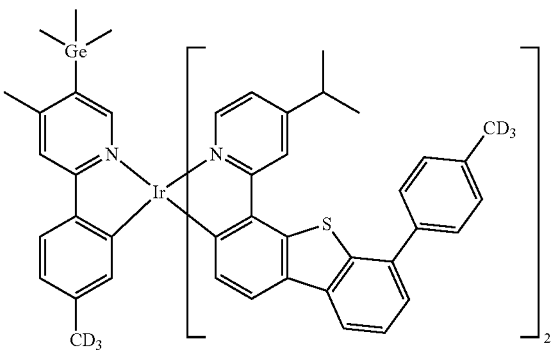
4586
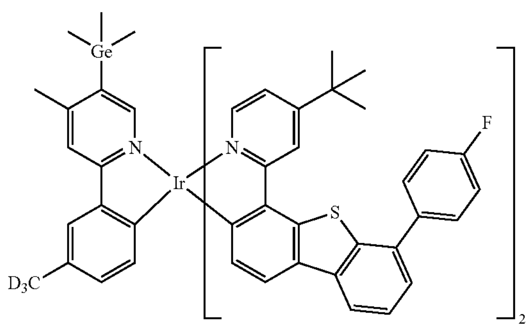
4587
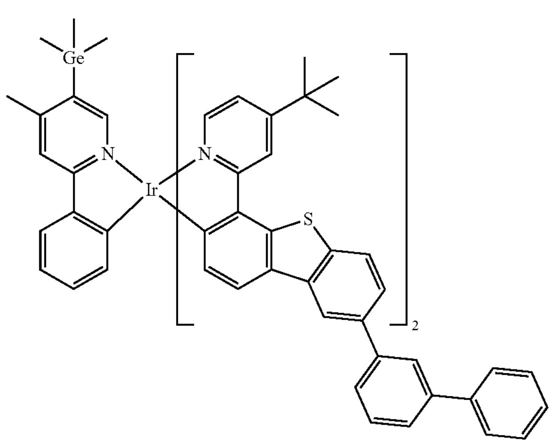
-continued
4588
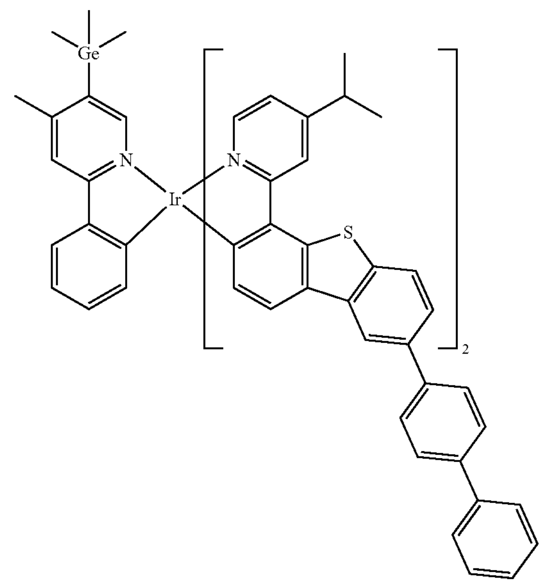
4589
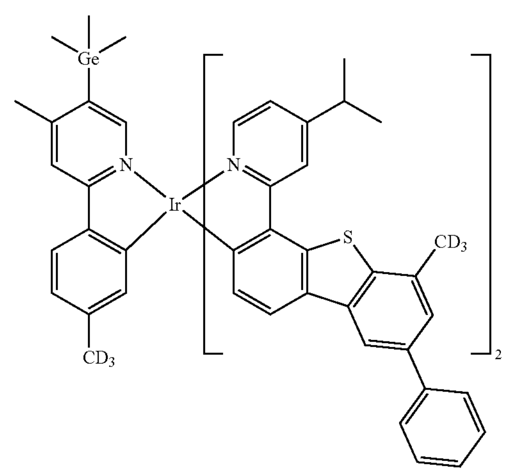
4590
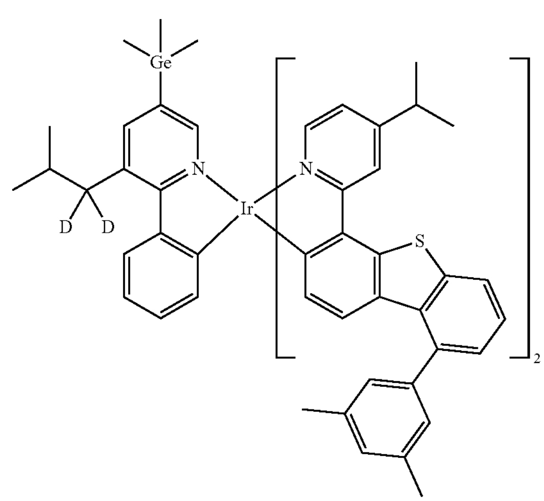

-continued
4591
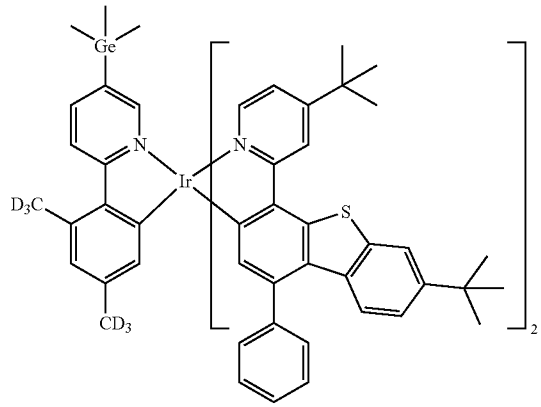
4592
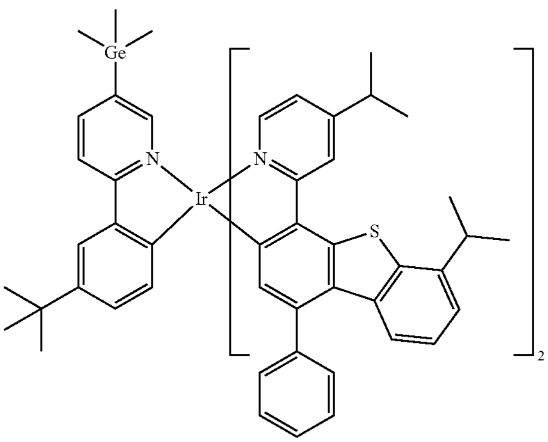
4593
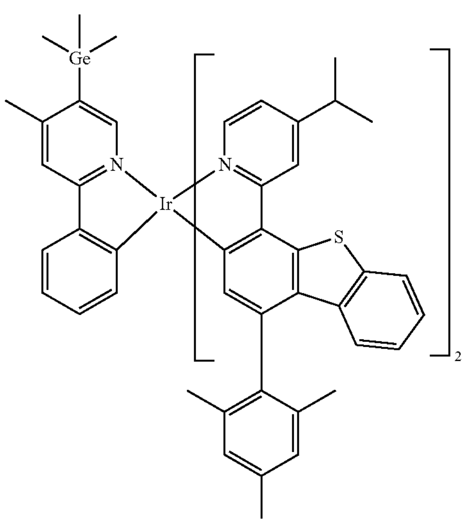
-continued
4594
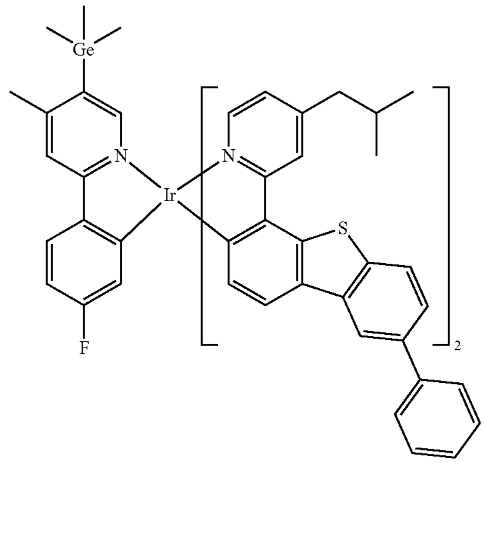
4595
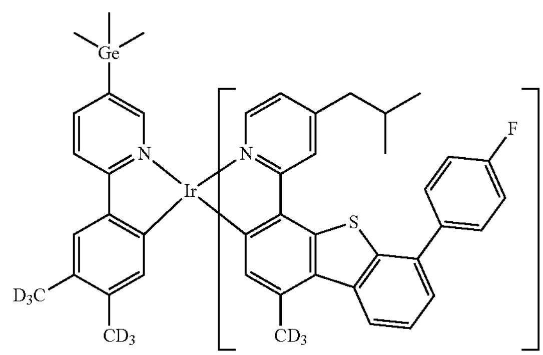
4596
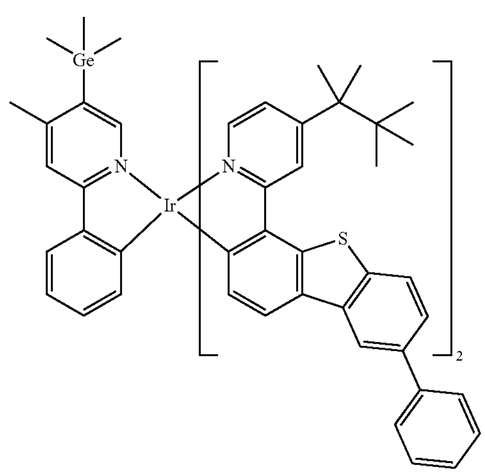

4597
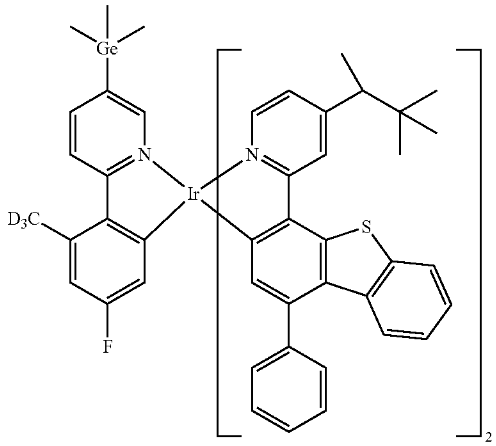
4599
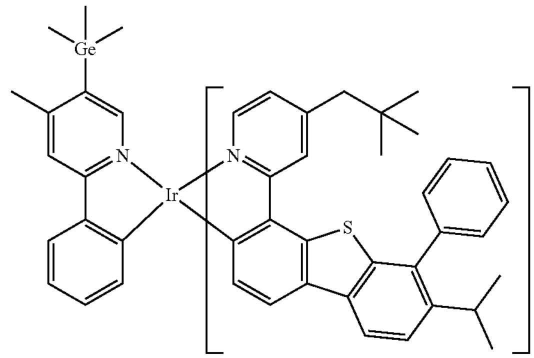
4598
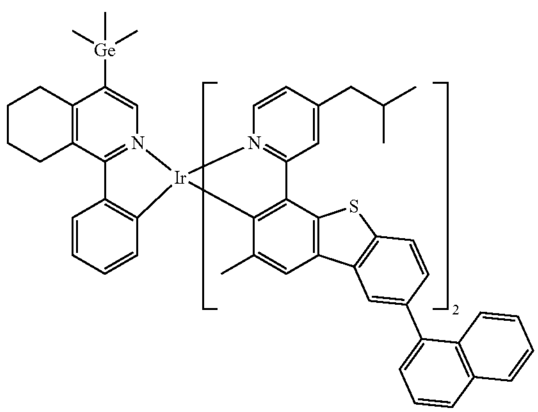
4600
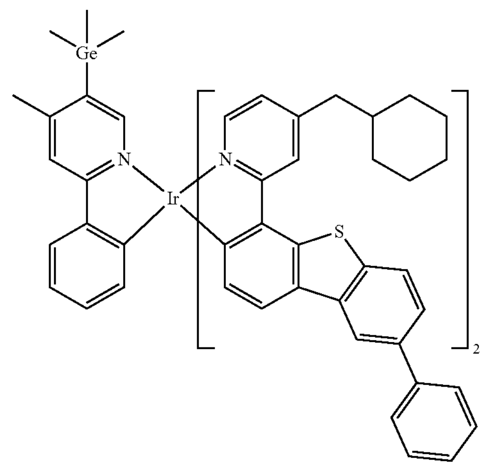
4601
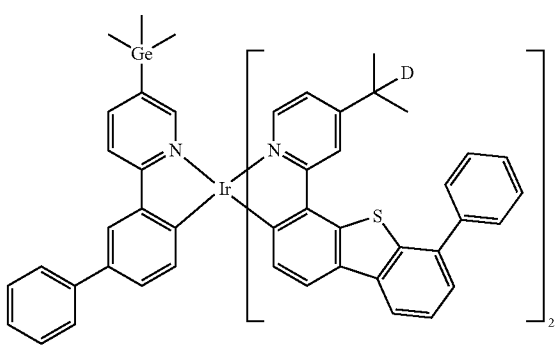
4602
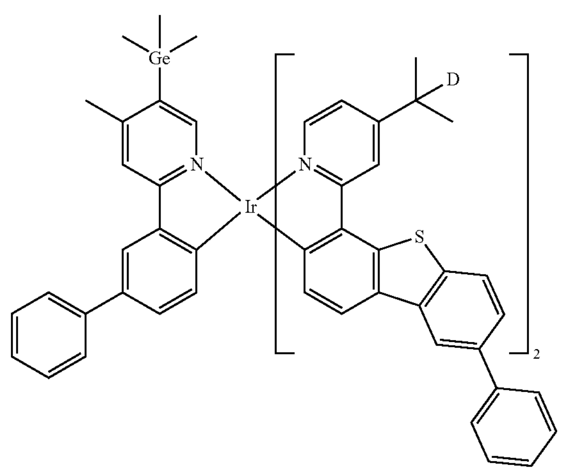

-continued
4603
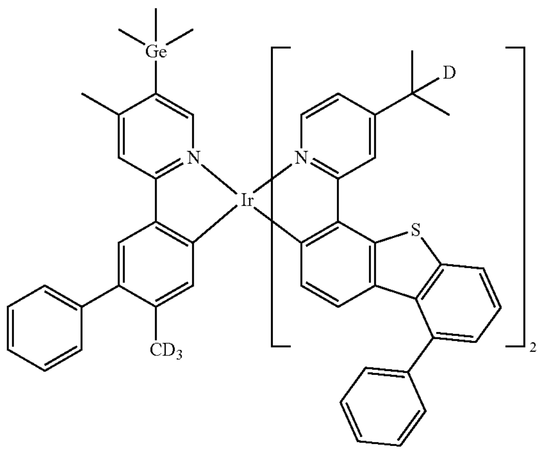
4604
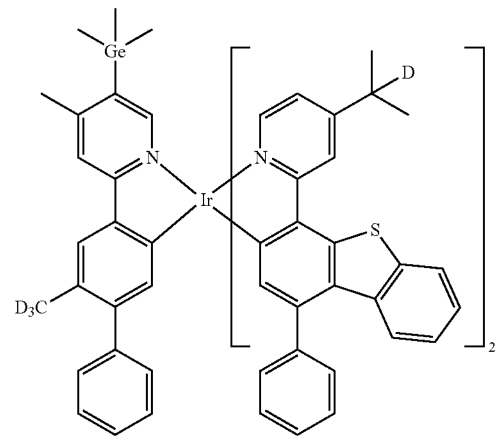
4605
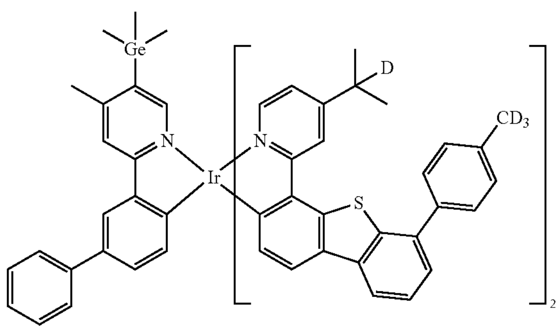
4606
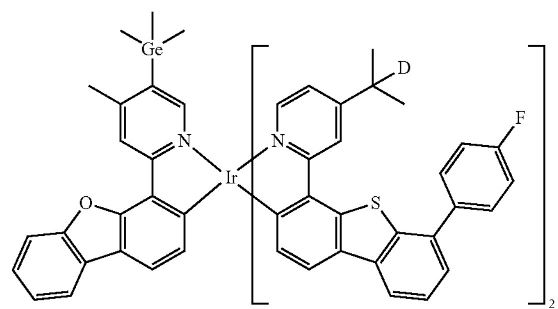
4607
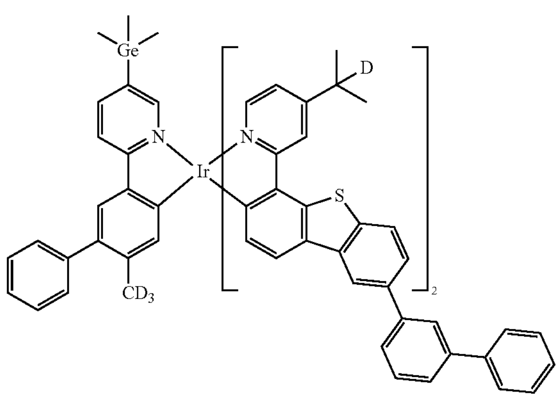
4608
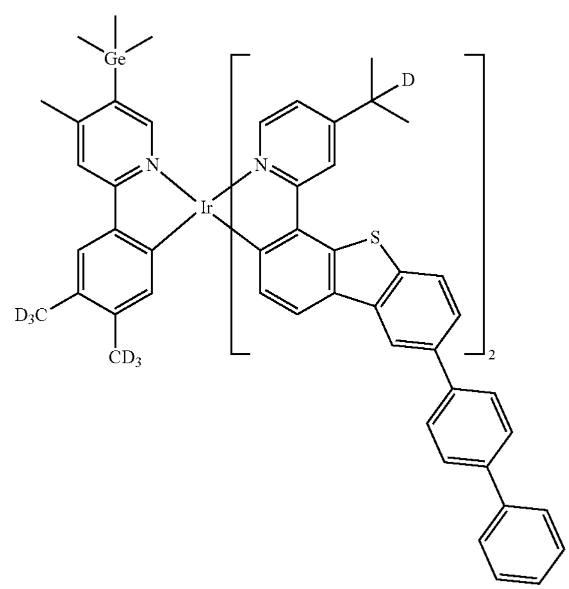

-continued
4609
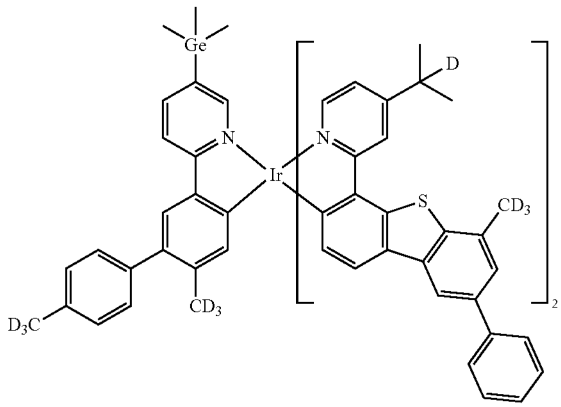
4610
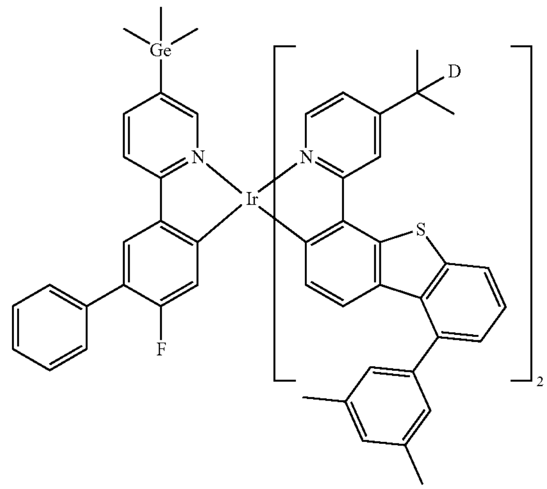
4611
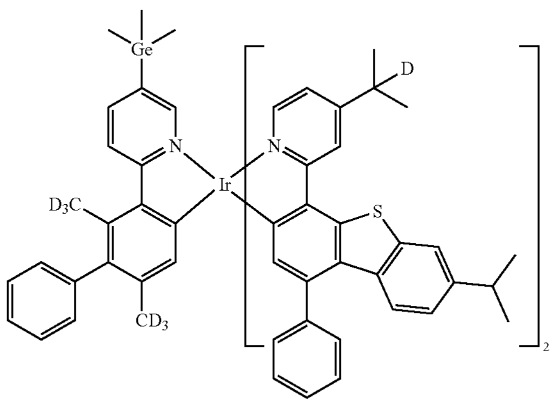
4612
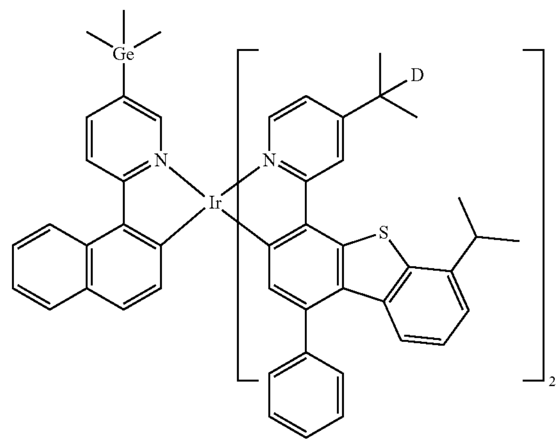
4613
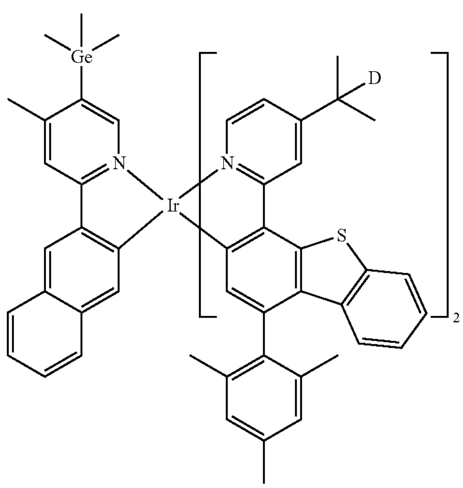
4614
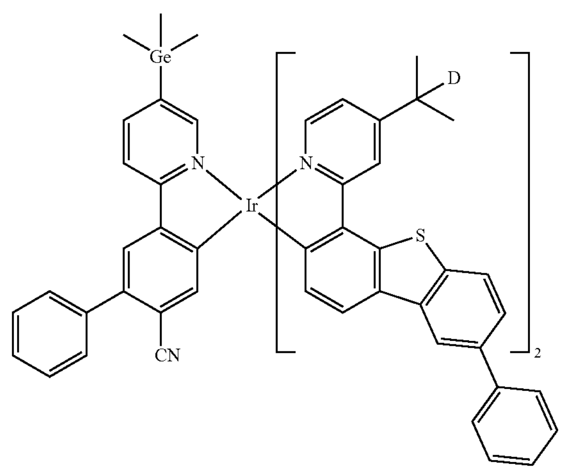

-continued
4615
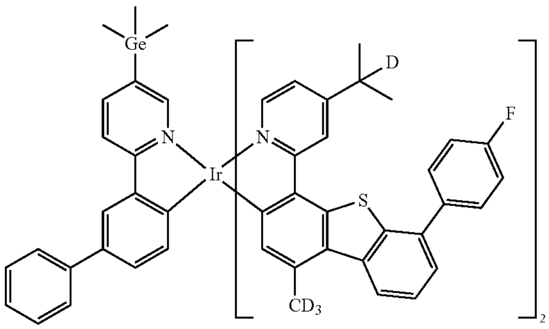
4616
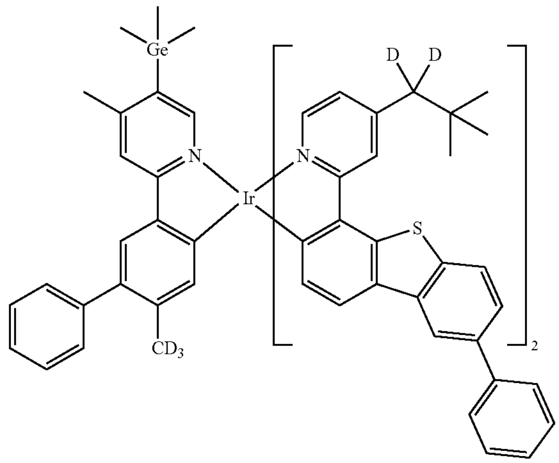
4617
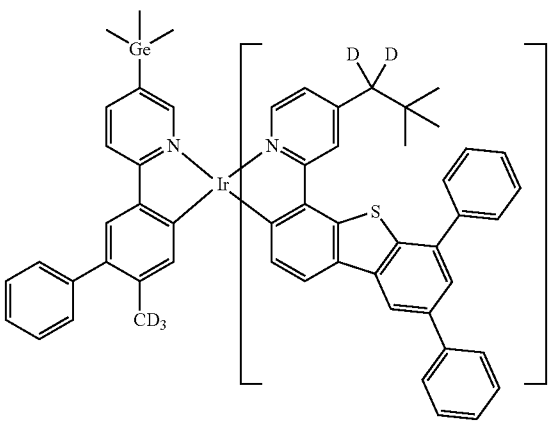
4618
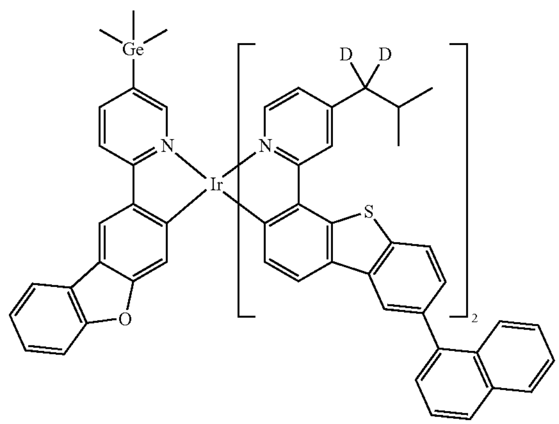
4619
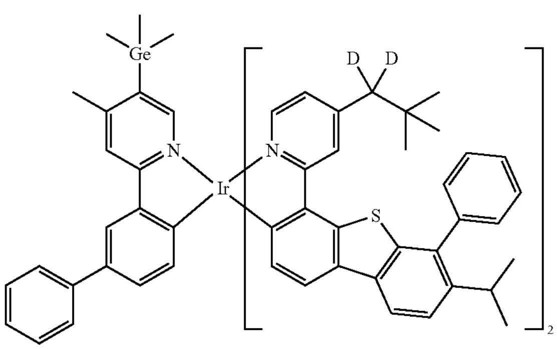
4620
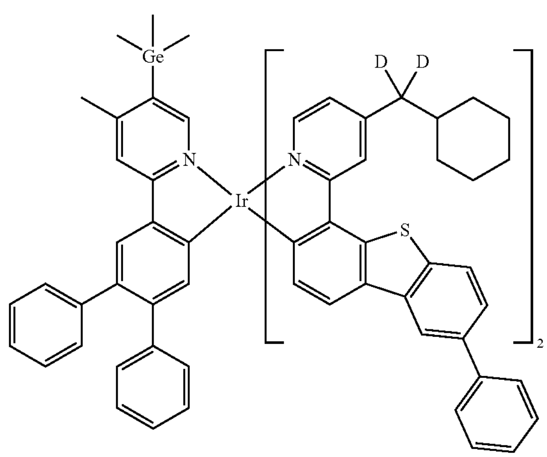

-continued
4621
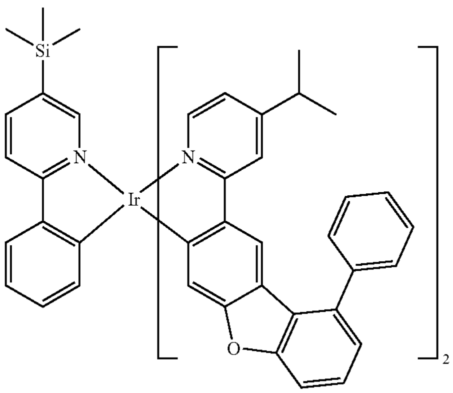
4622
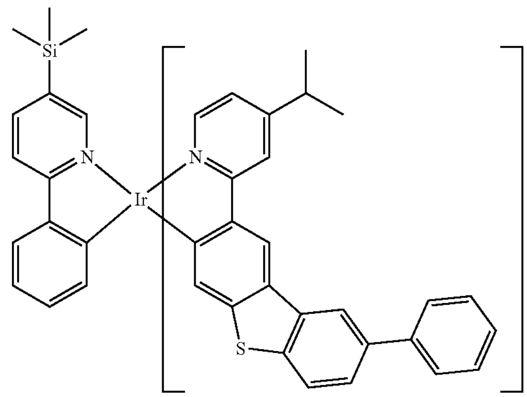
4623
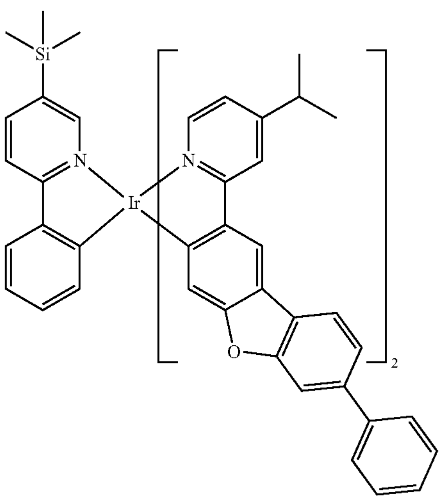
4624
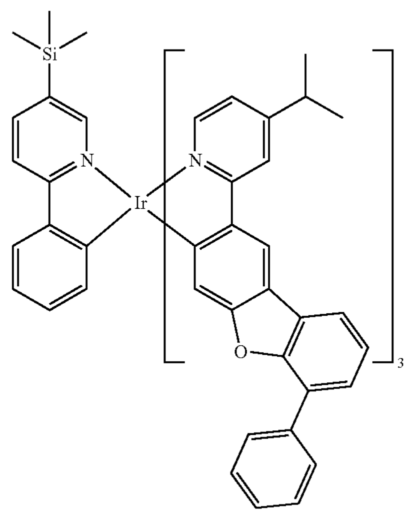
4625
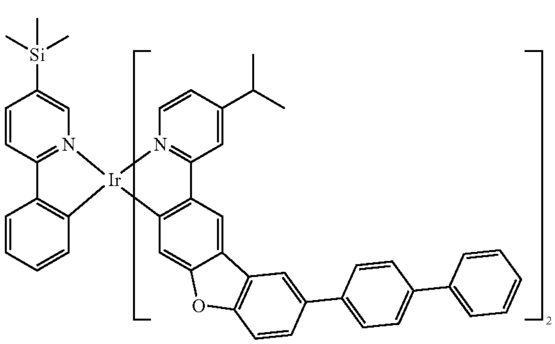
4626
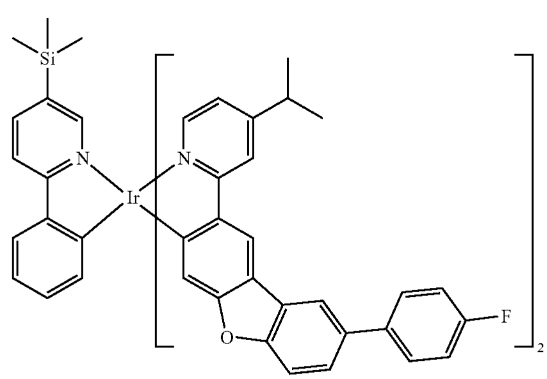

-continued
4627
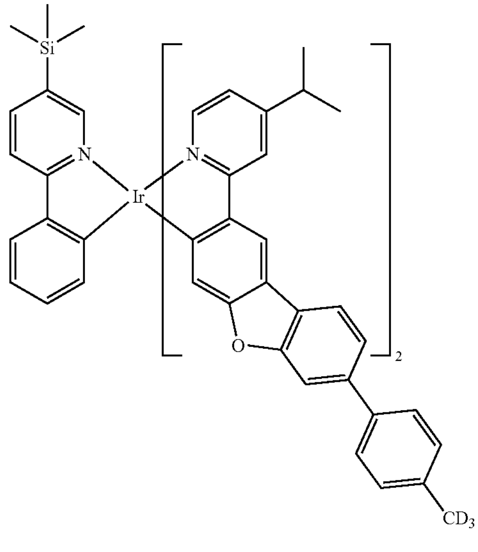
4628
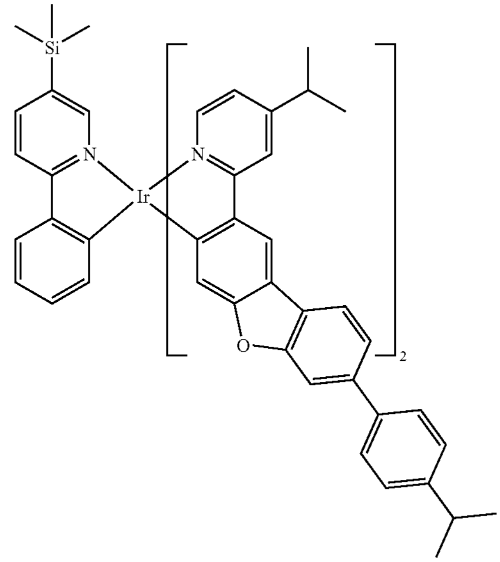
4629
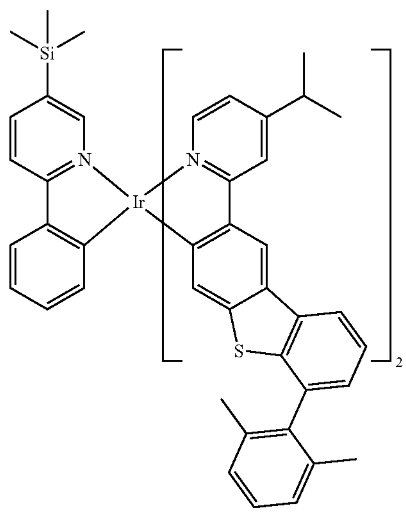
4630
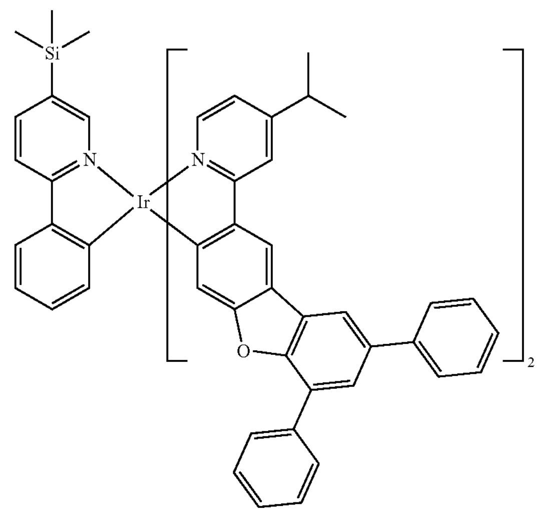
4631
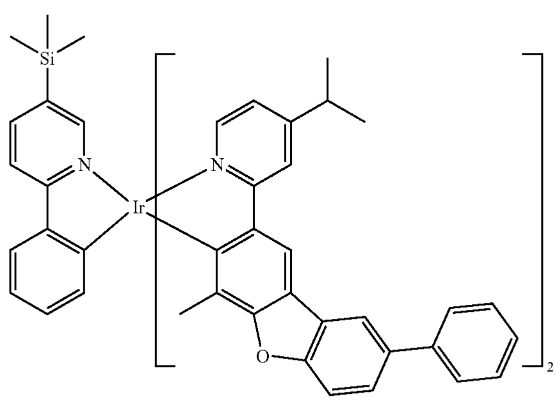
4632
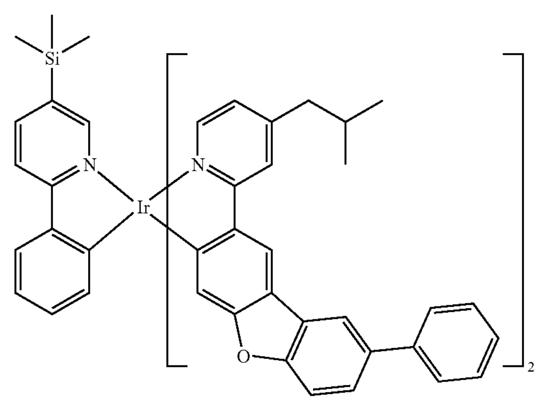

-continued
4633
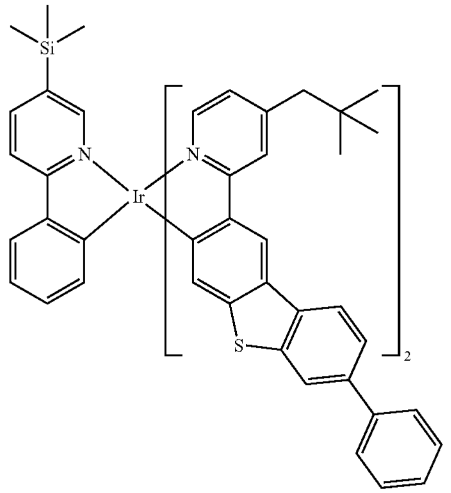
4634
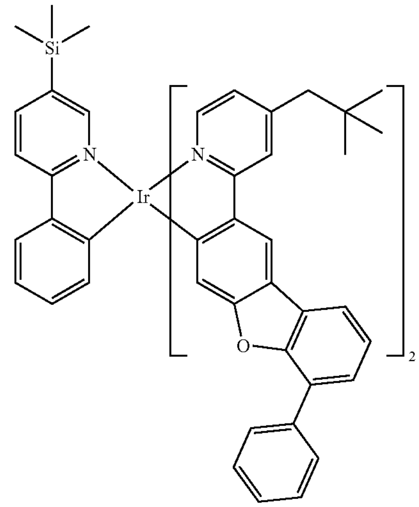
4635
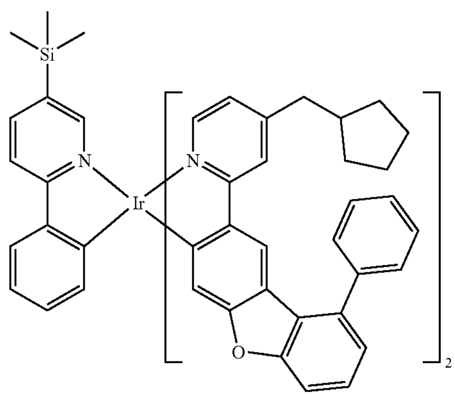
4636
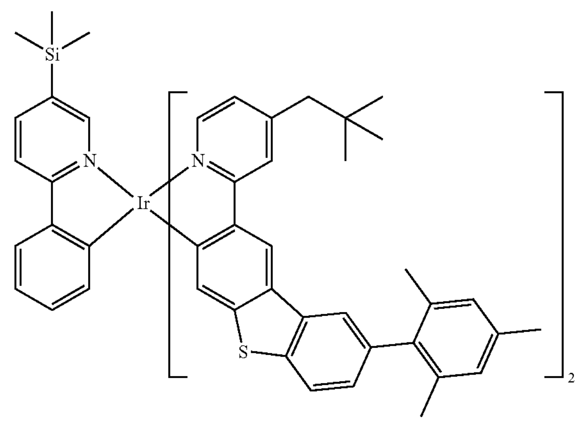
4637
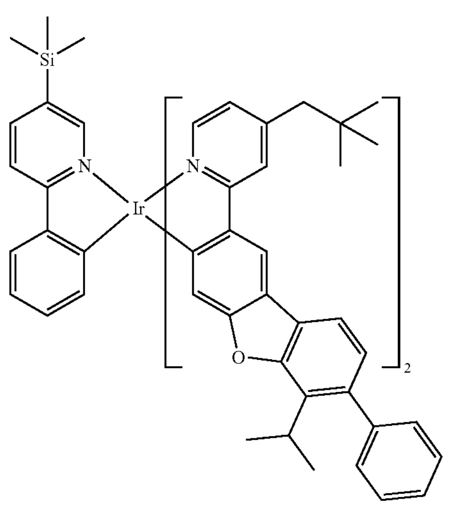
4638
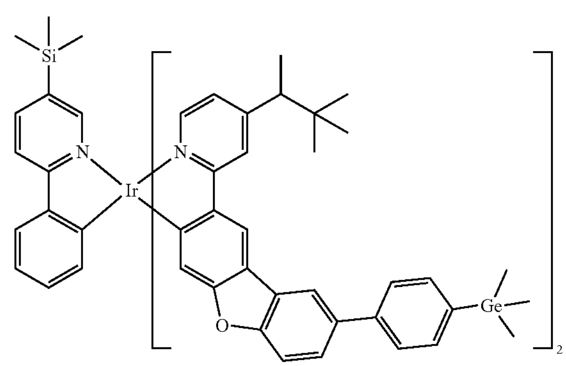

-continued
4639
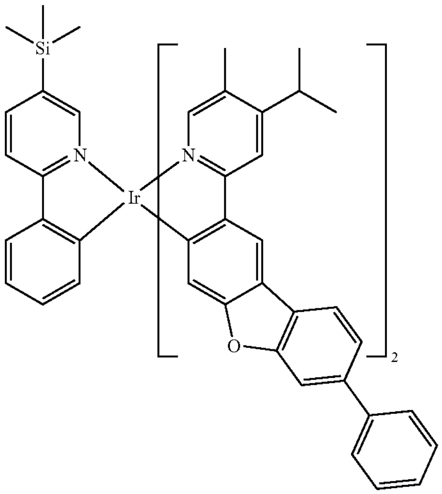
4640
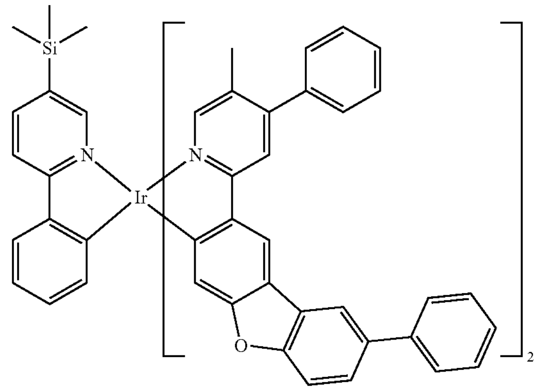
4641
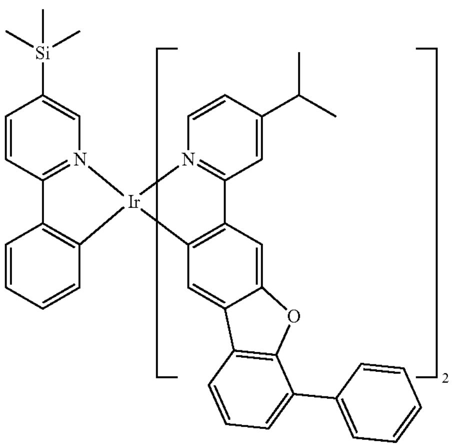
4642
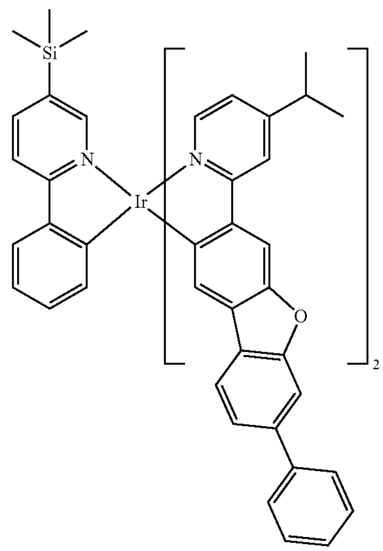
4643
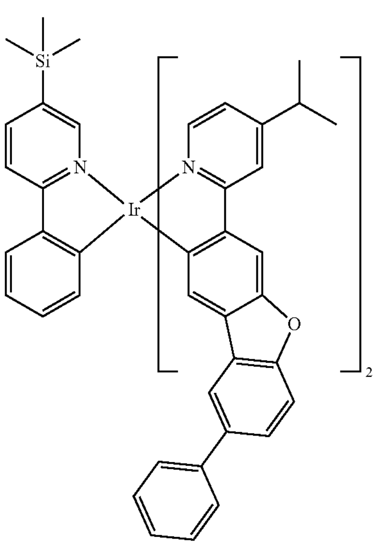
4644
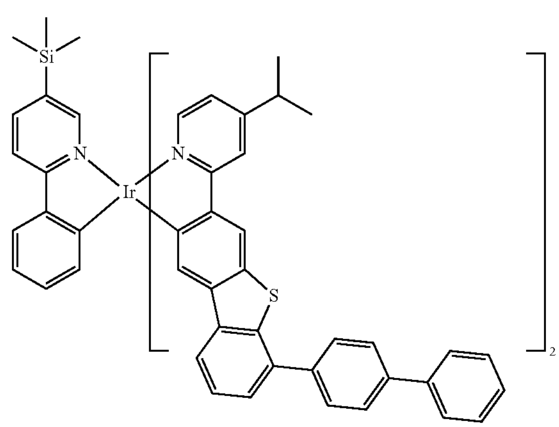

-continued
4645
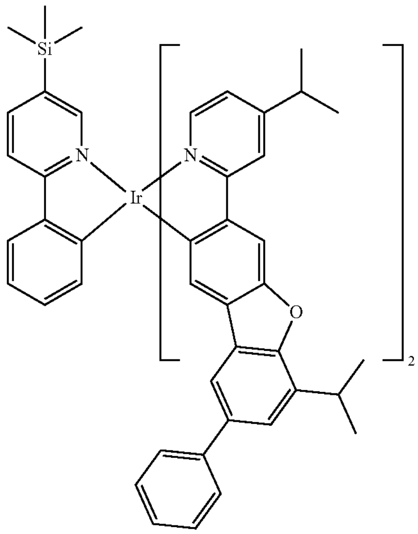
4646
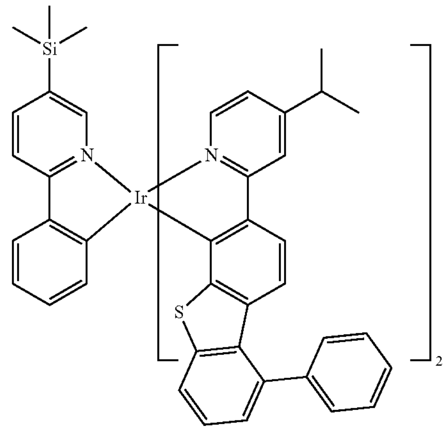
4647
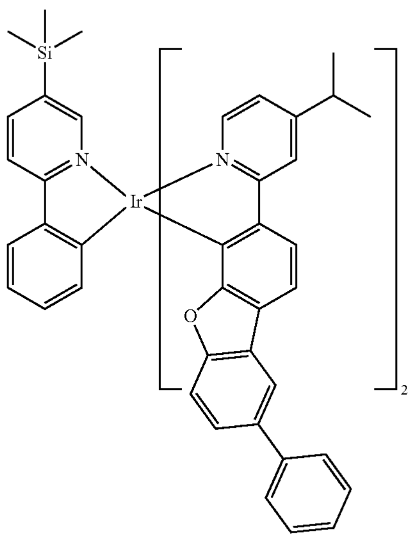
4648
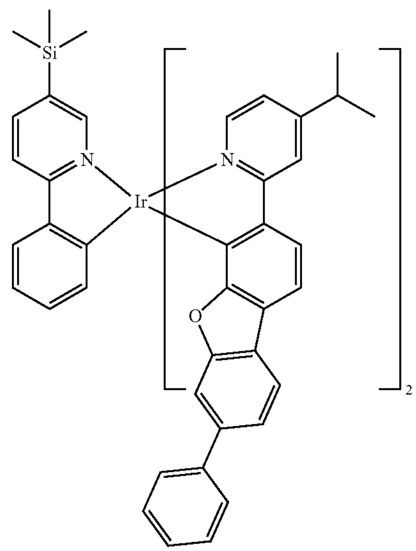
4649
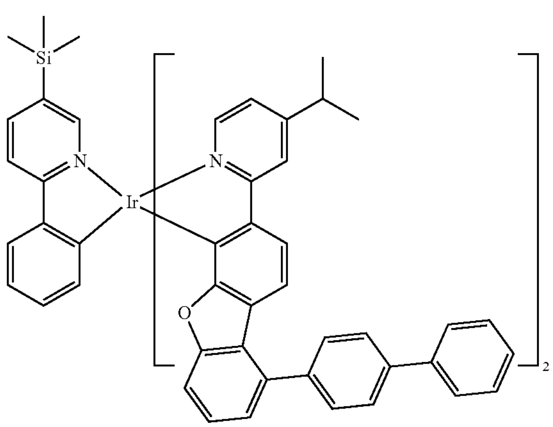
4650
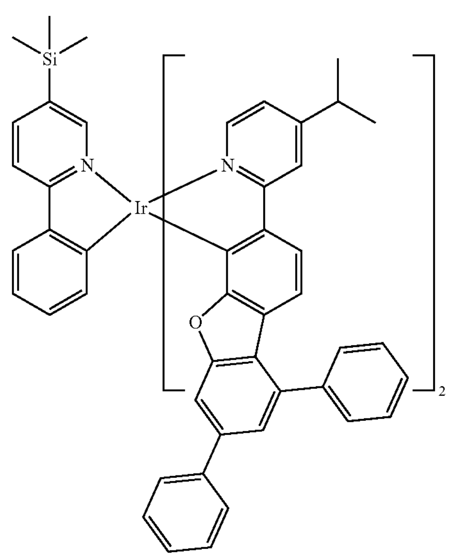

-continued
4651
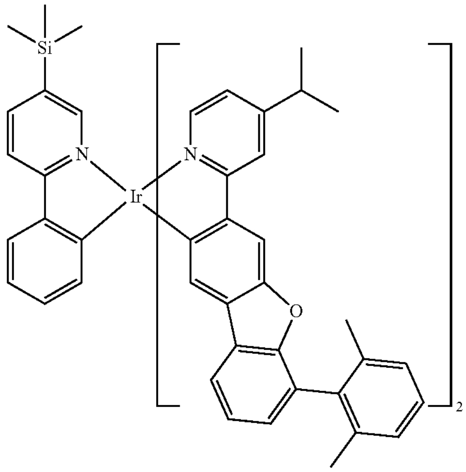
4652
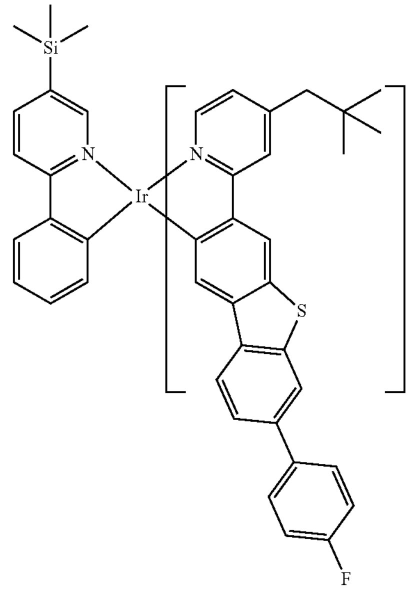
4653
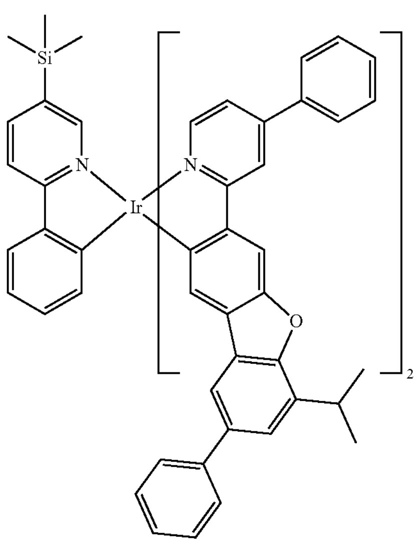
4654
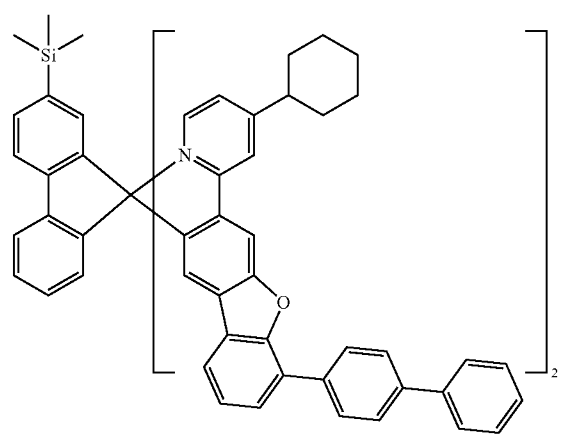

-continued
4655
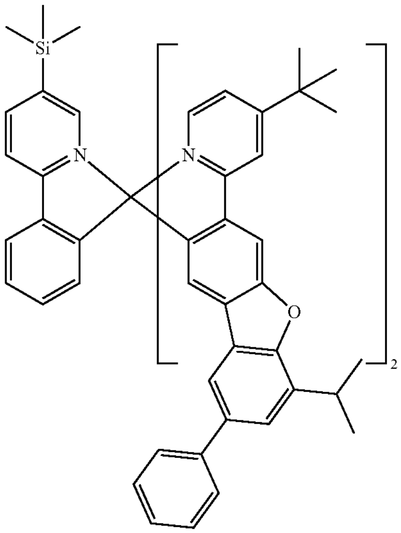
4656
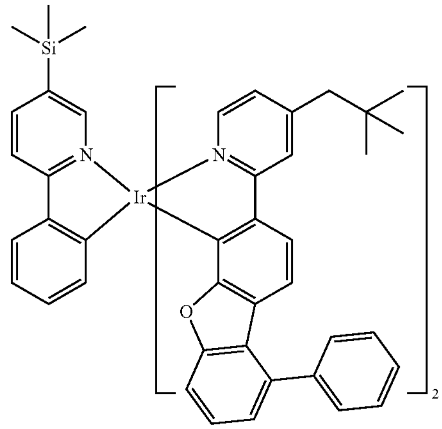
4657
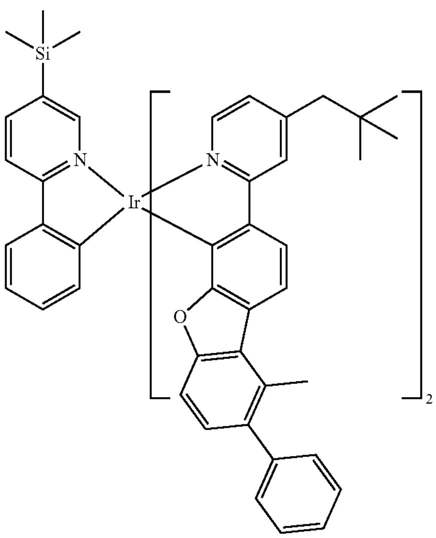
4658
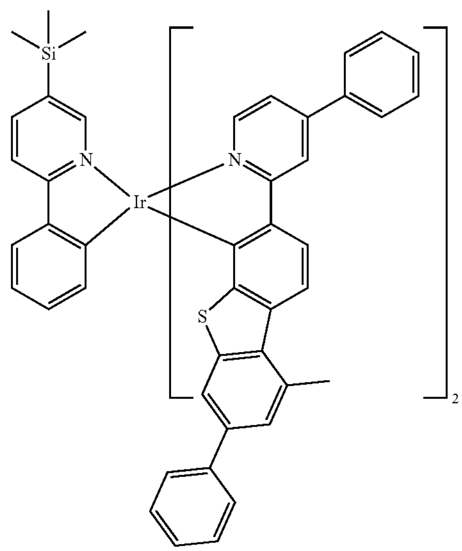
4659
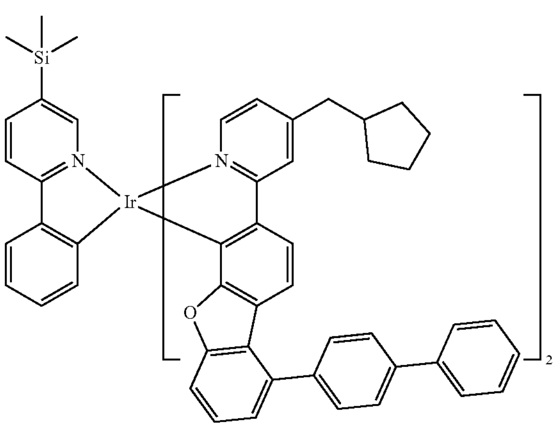
4660
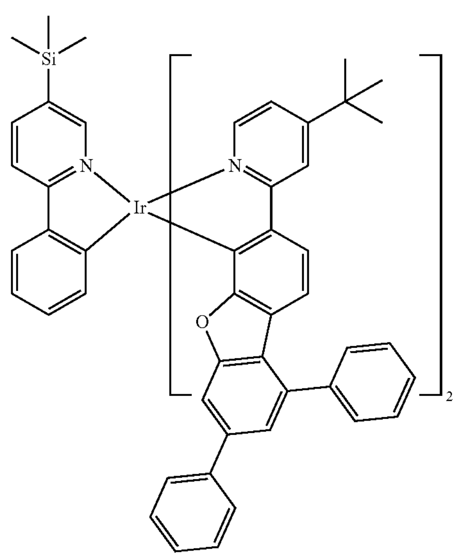

-continued
4661
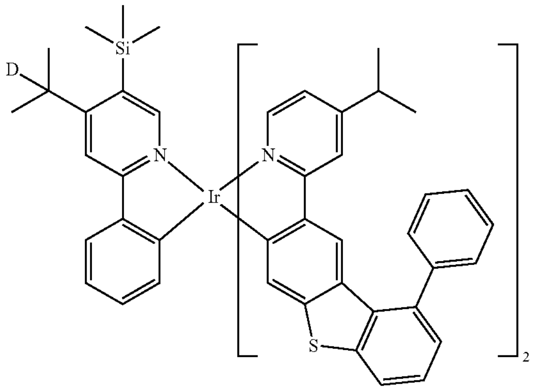
4662
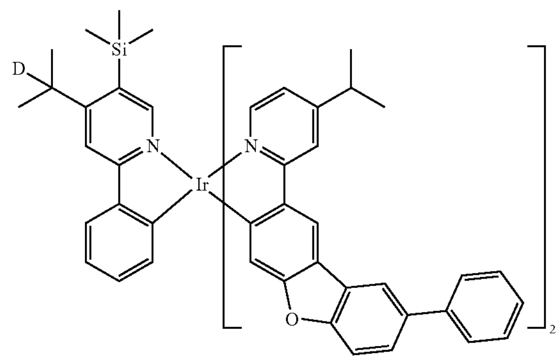
4663
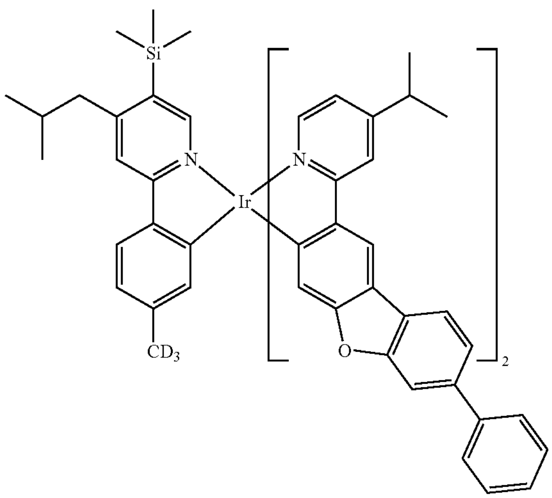
4664
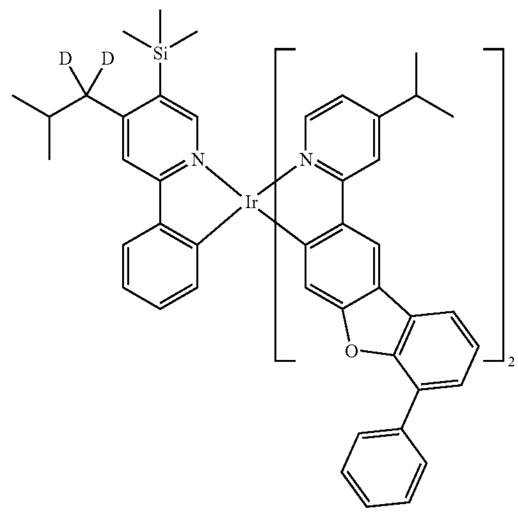
4665
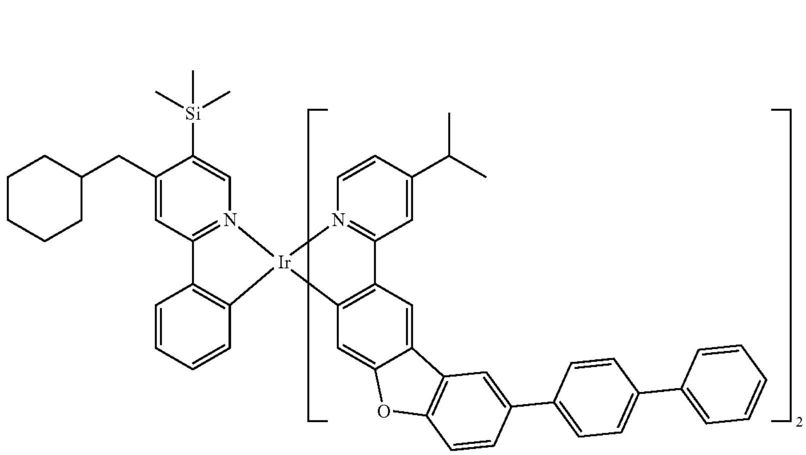

-continued
4666
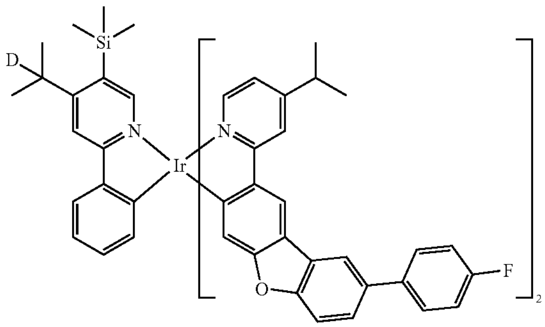
4667
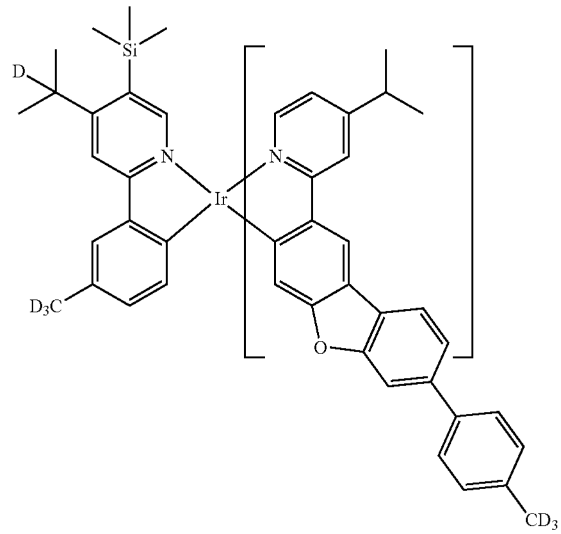
4668
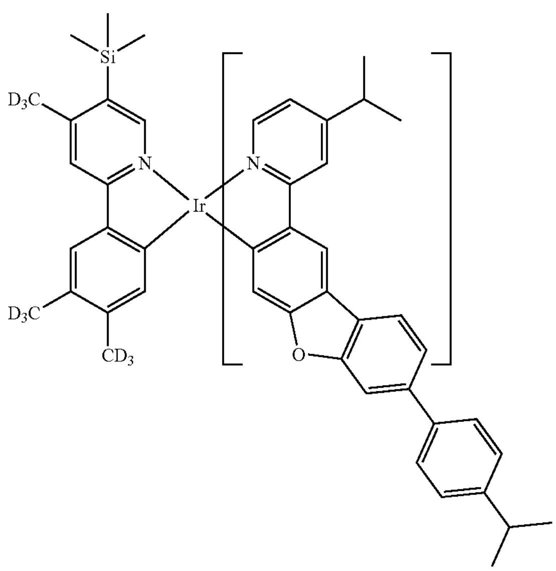
4669
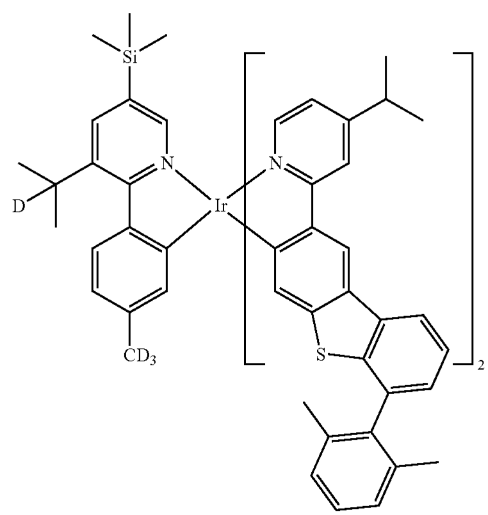
4670
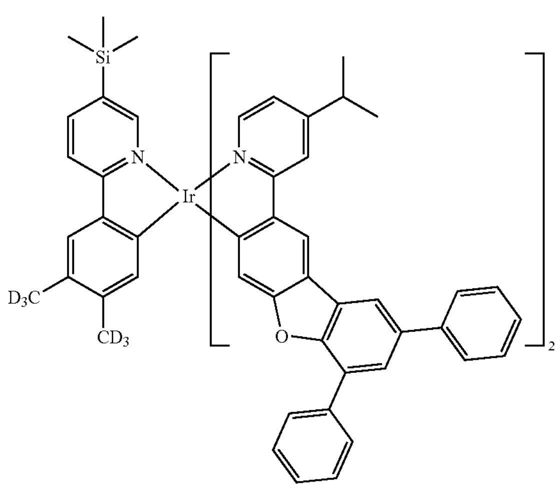
4671
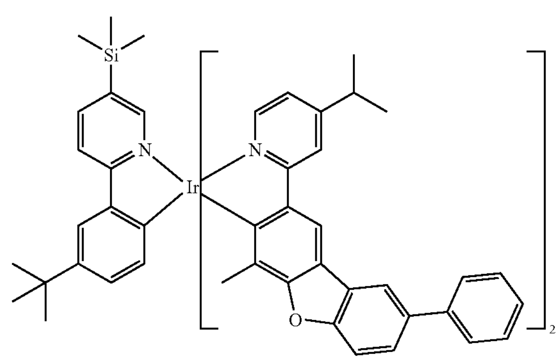

-continued
4672
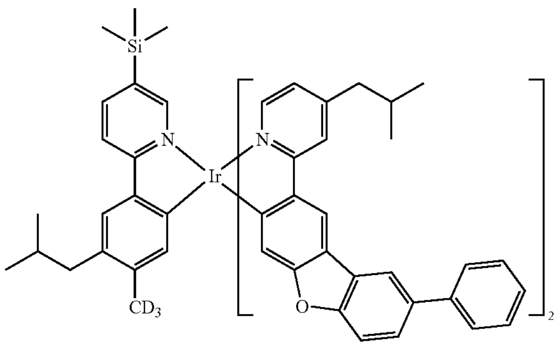
4673
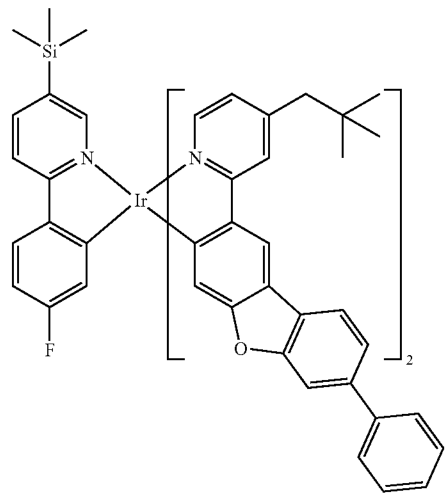
4674
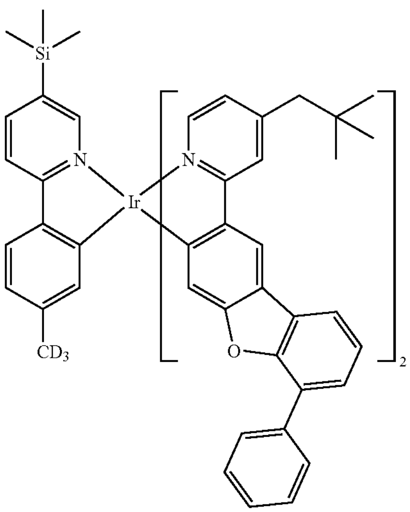
4675
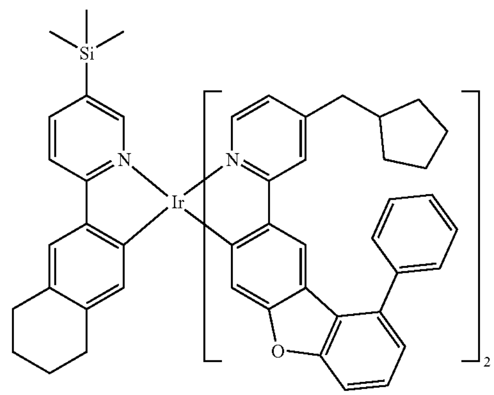
4676
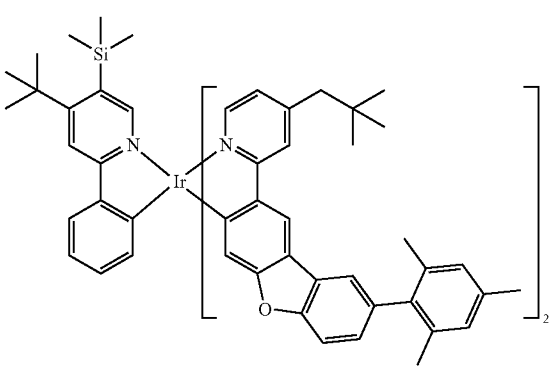
4677
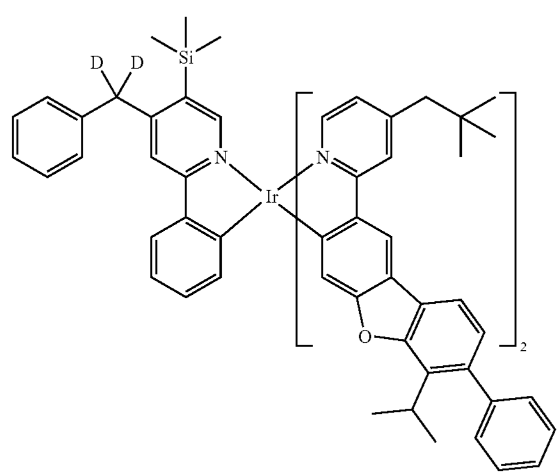

-continued
4678
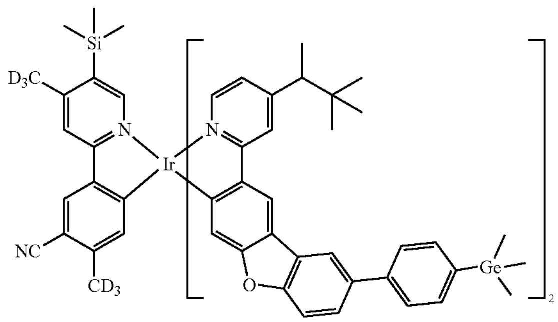
4679
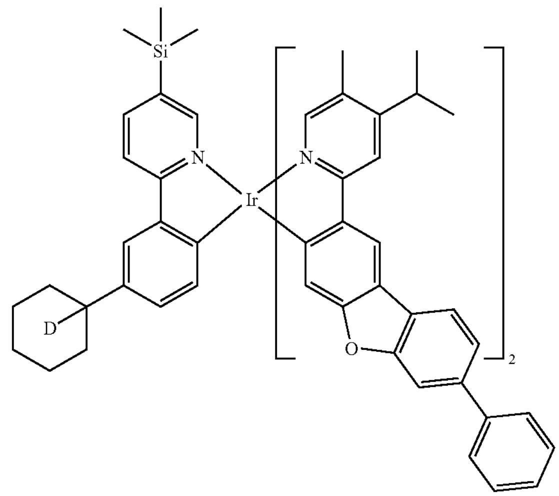
4680
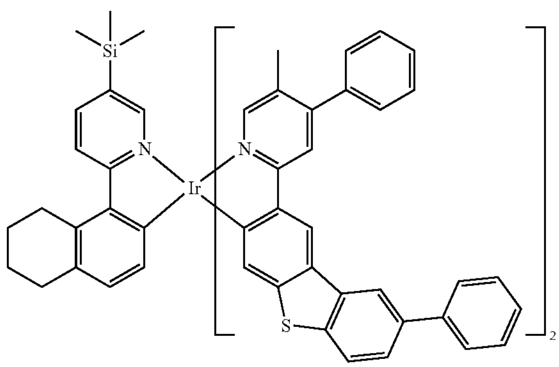
4681
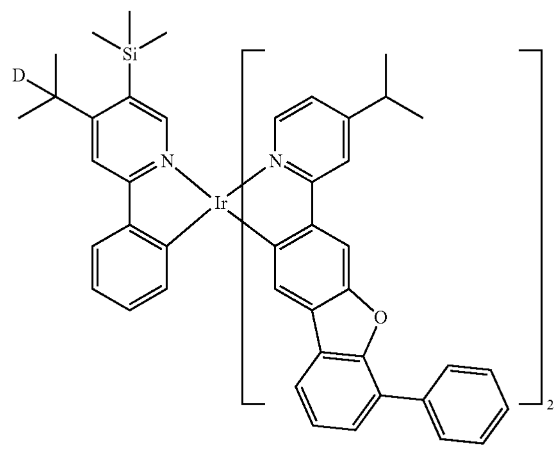
4682
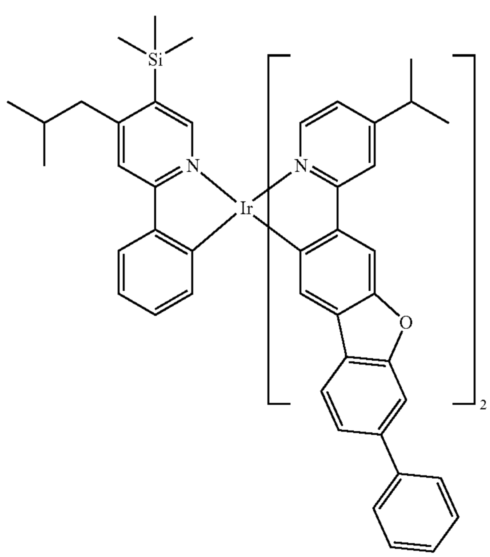
4683
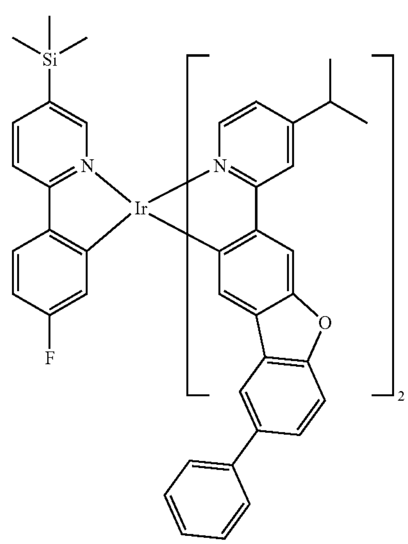

-continued
4684
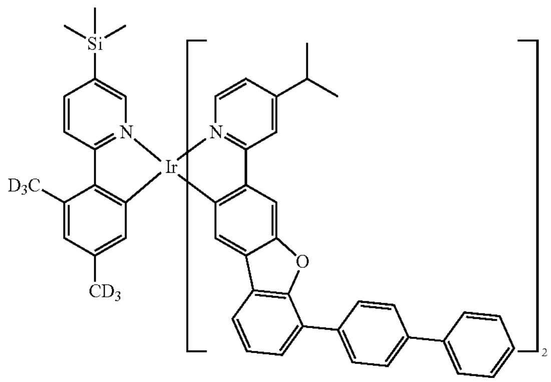
4685
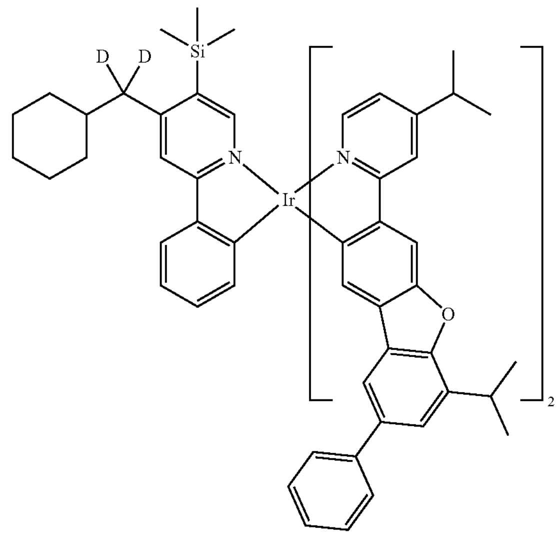
4686
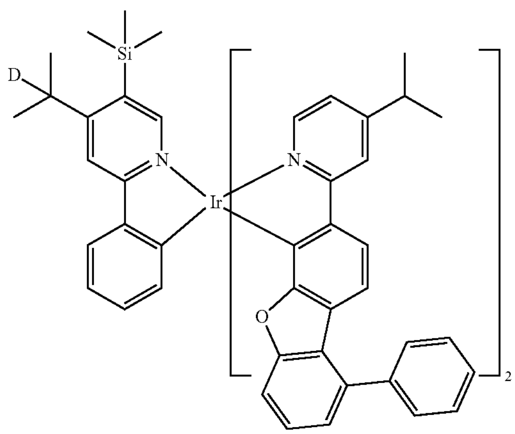
4687
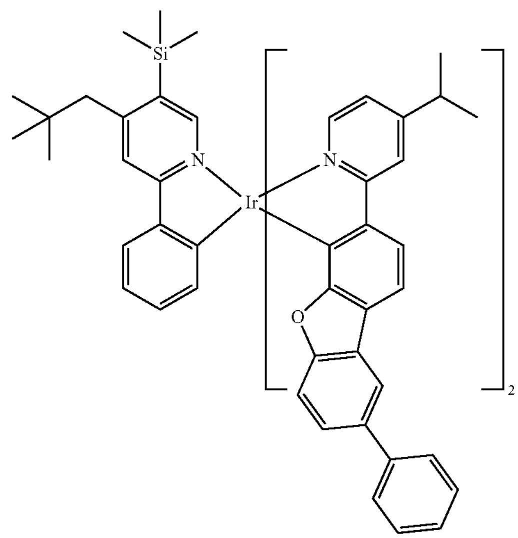
4688
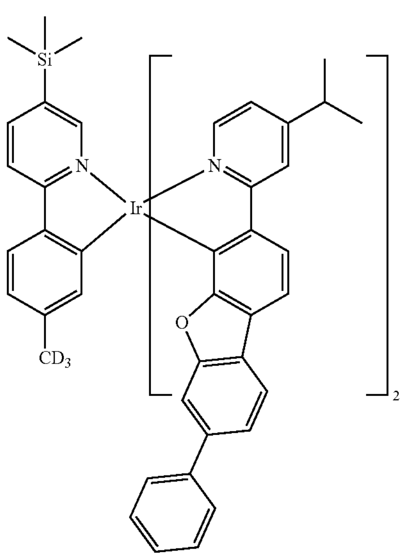
4689
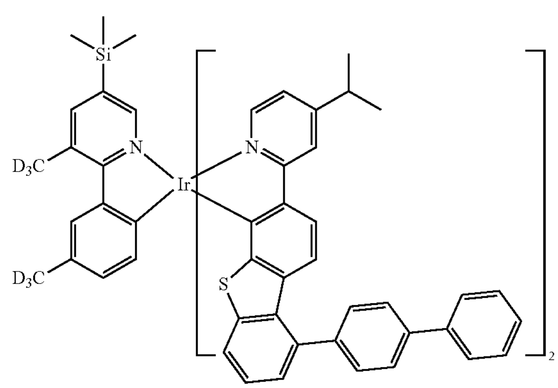

-continued
4690
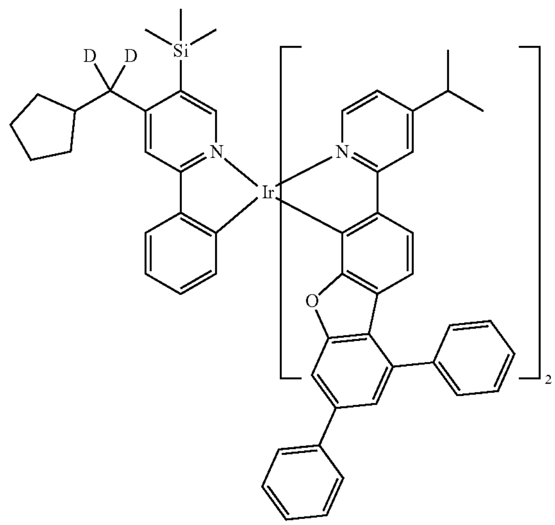
4691
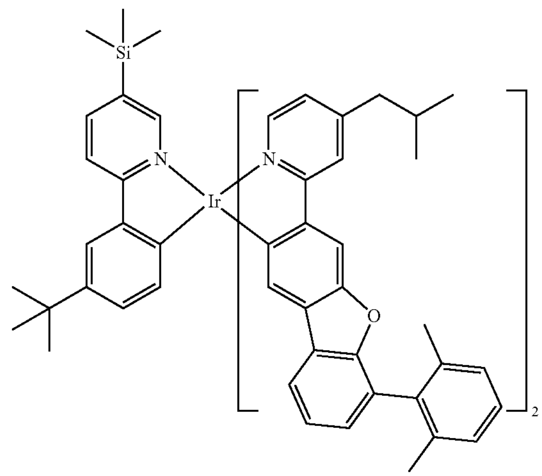
4692
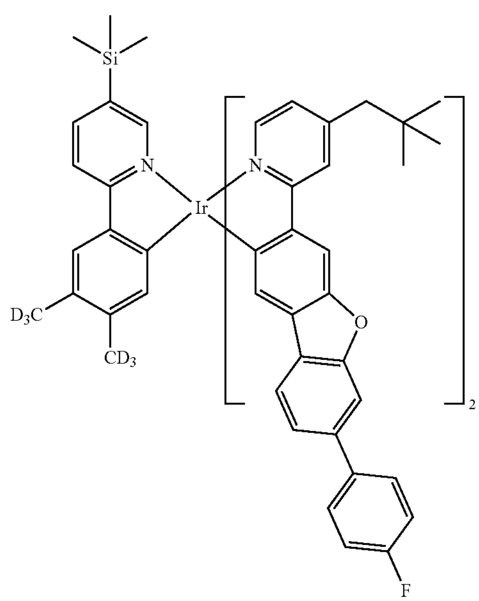
4693
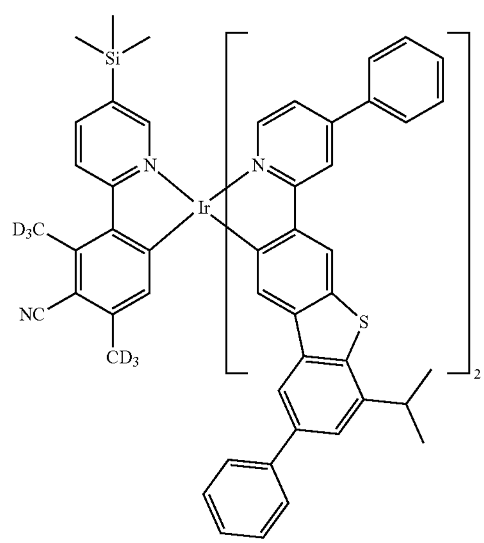

-continued
4694
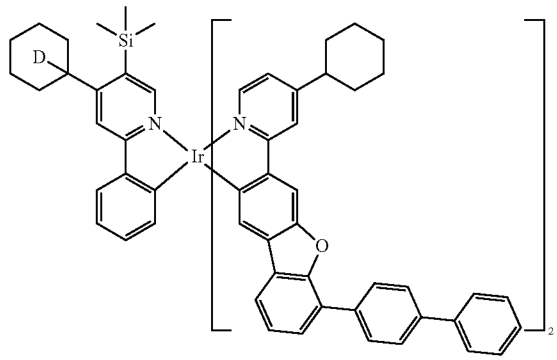
4695
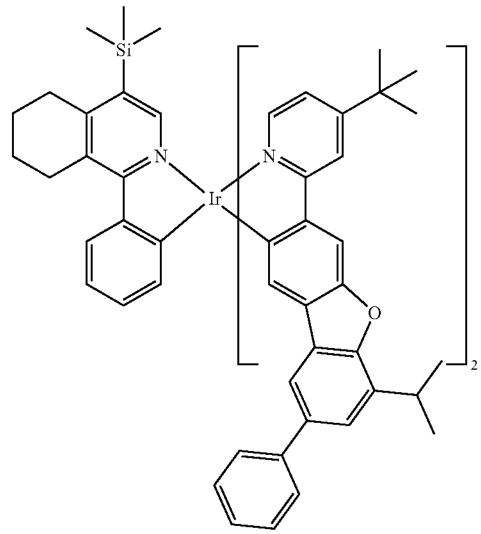
4696
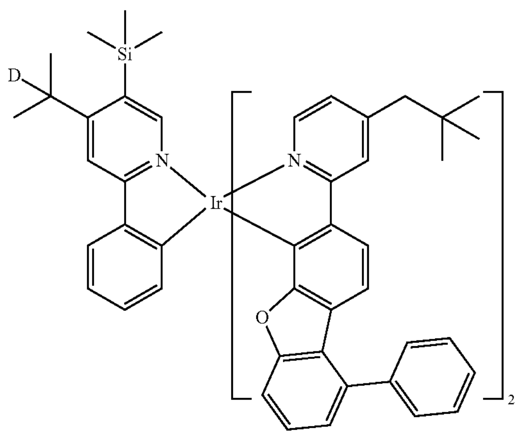
4697
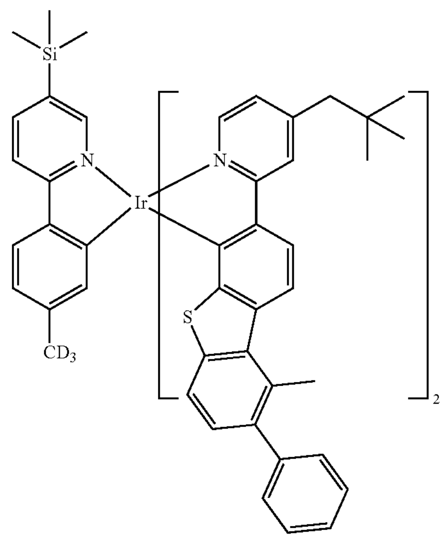
4698
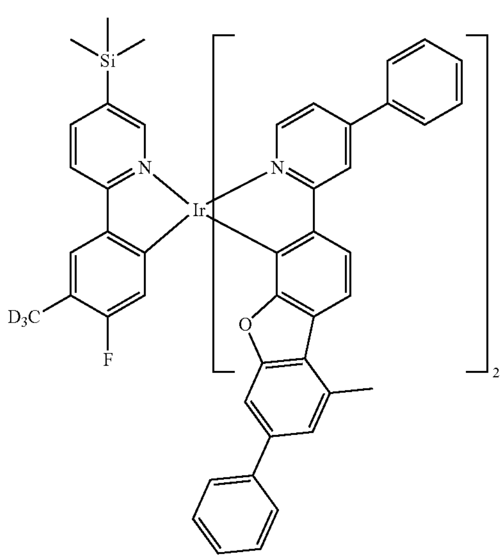
4699
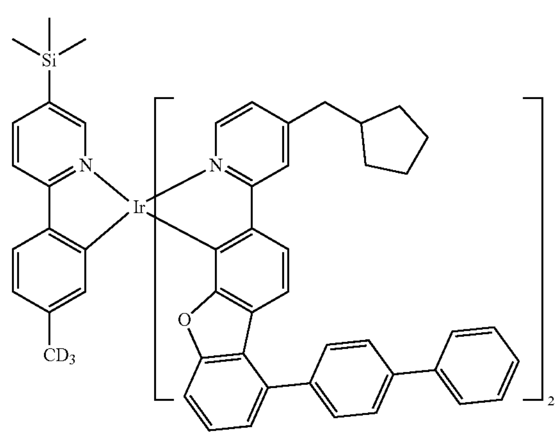

-continued
4700
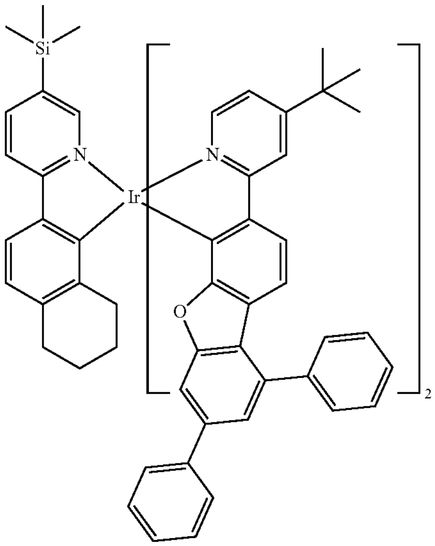
4701
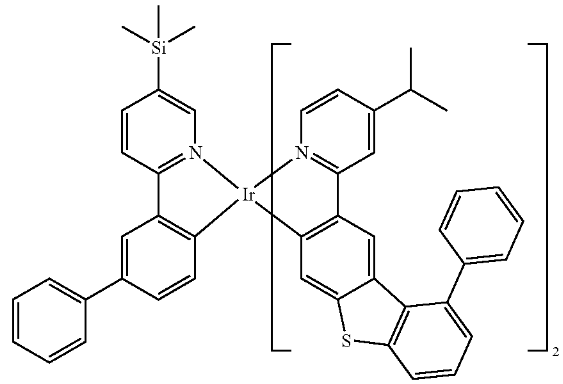
4702
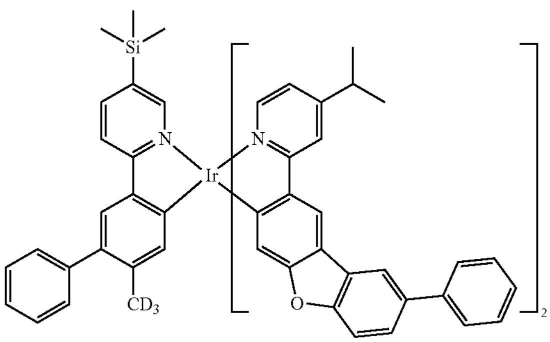
4703
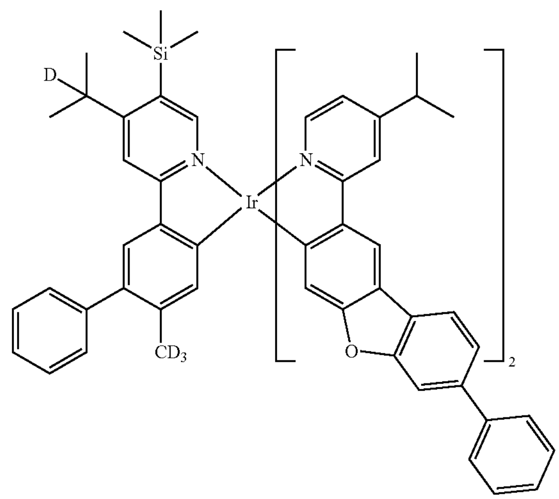
4704
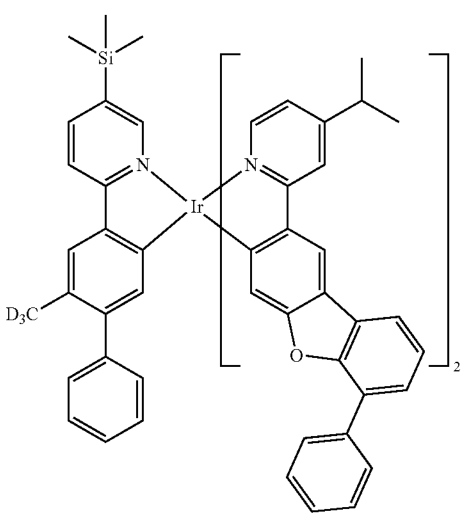
4705
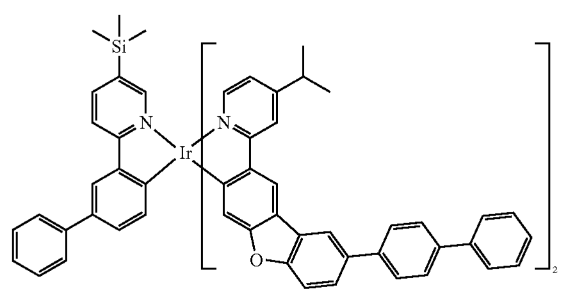

-continued
4706
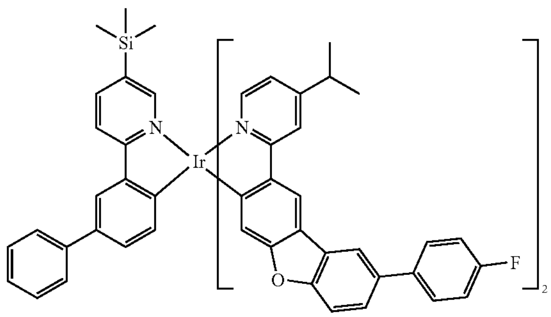
4707
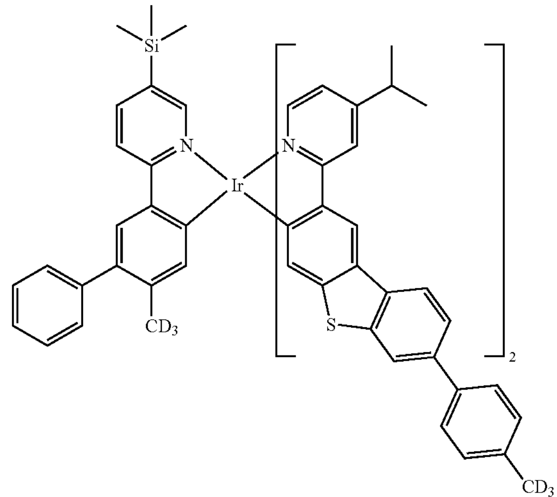
4708
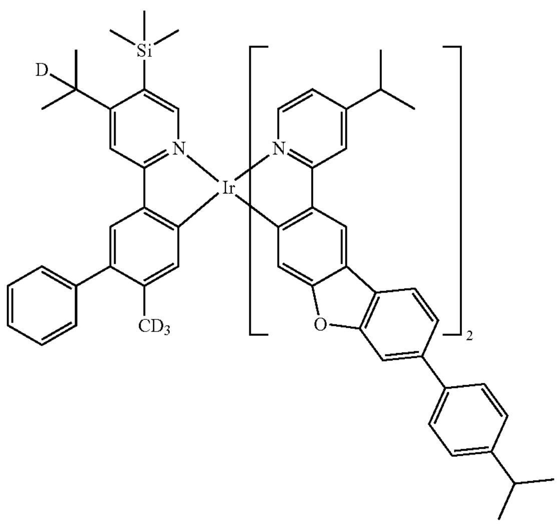
4709
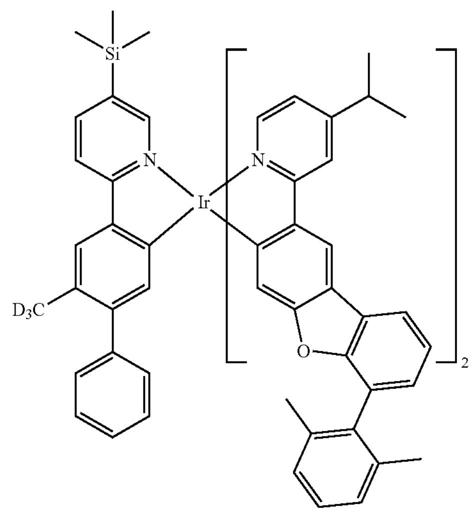
4710
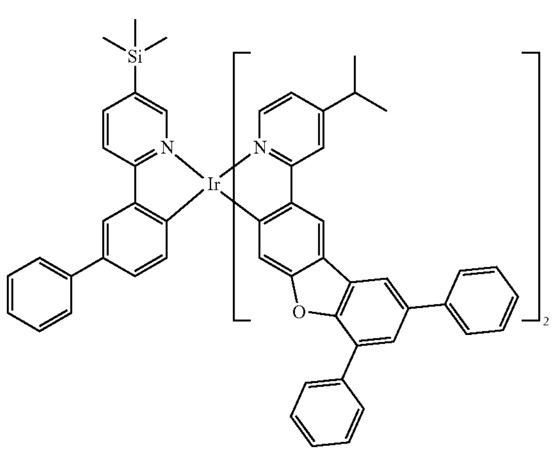
4711
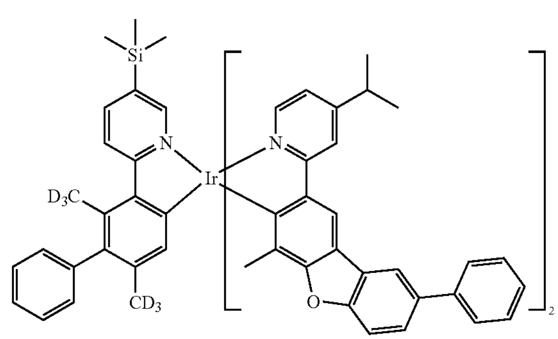

-continued
4712
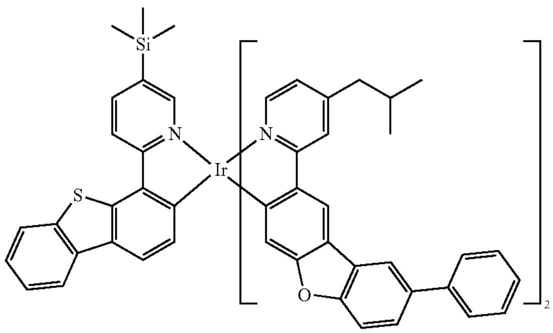
4713
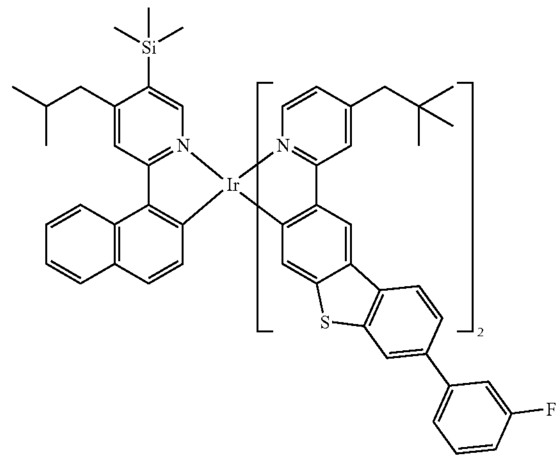
4714
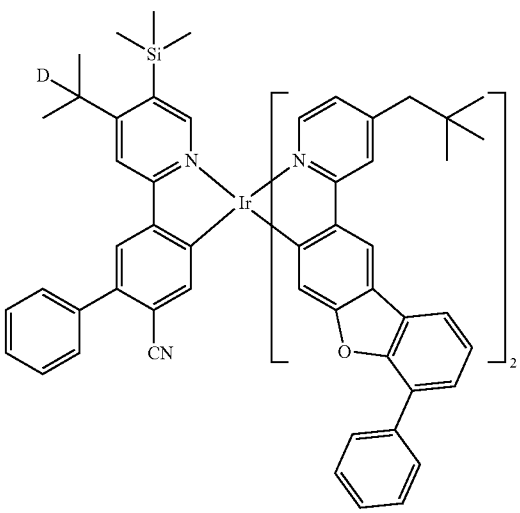
4715
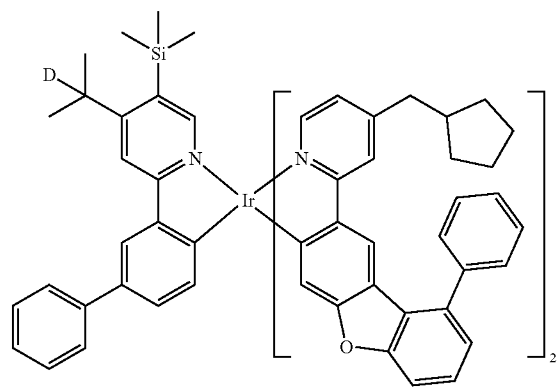
4716
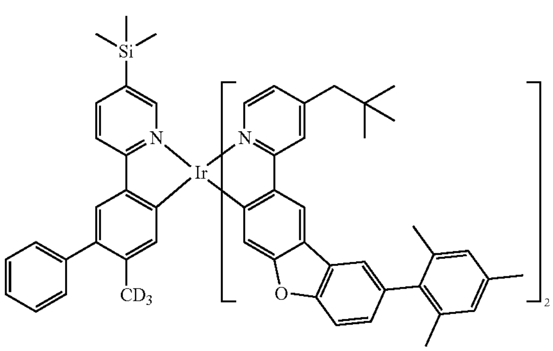
4717
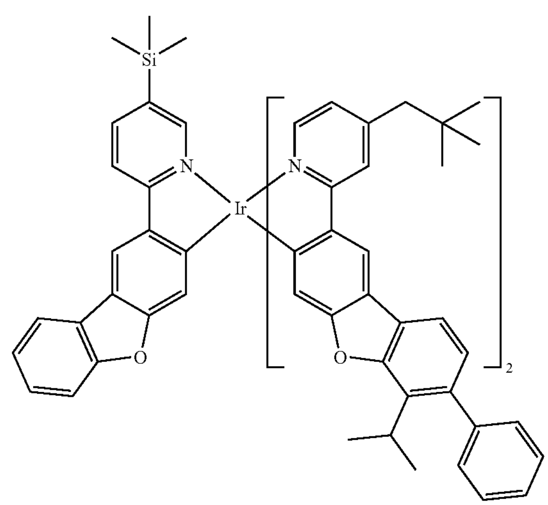

-continued
4718
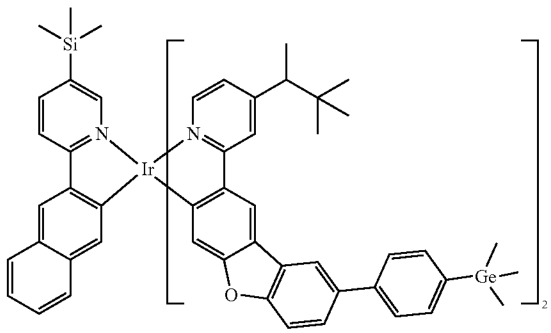
4719
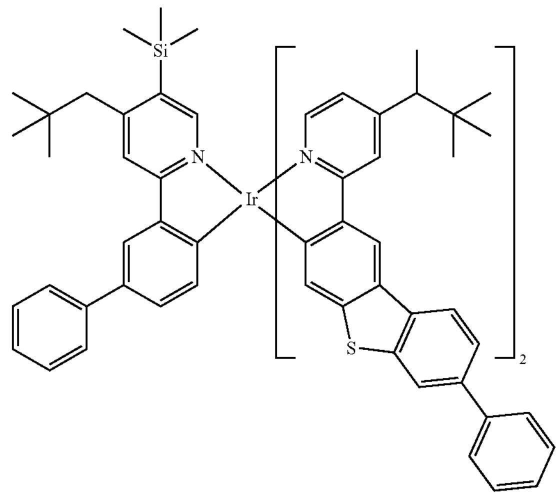
4720
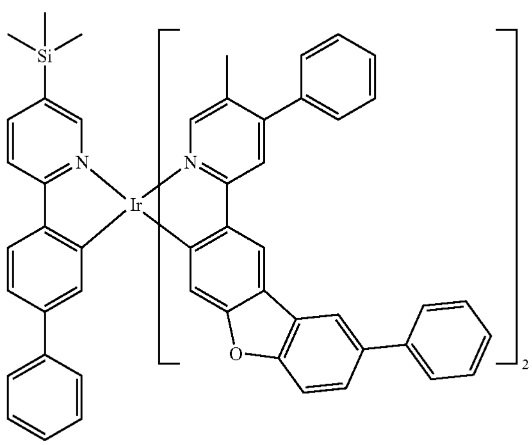
4721
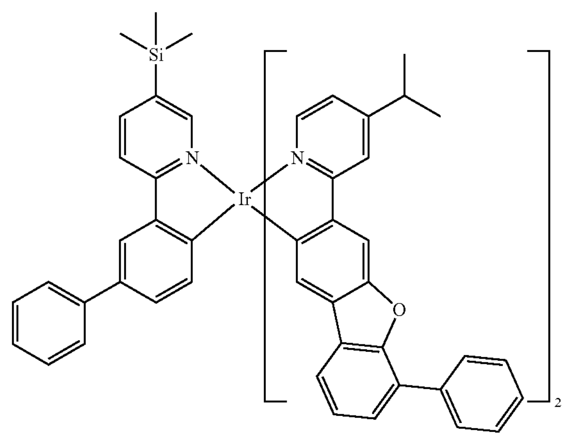
4722
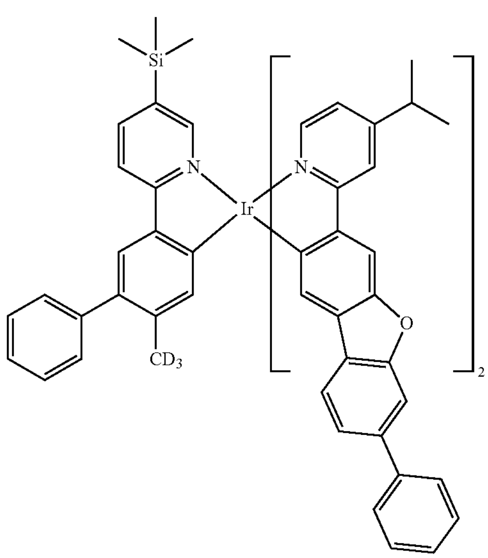
4723
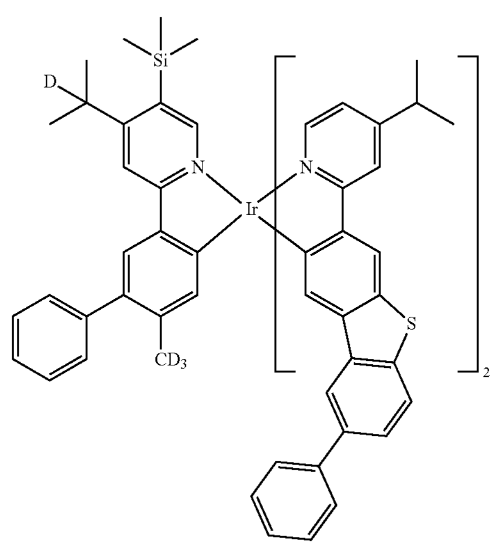

-continued
4724
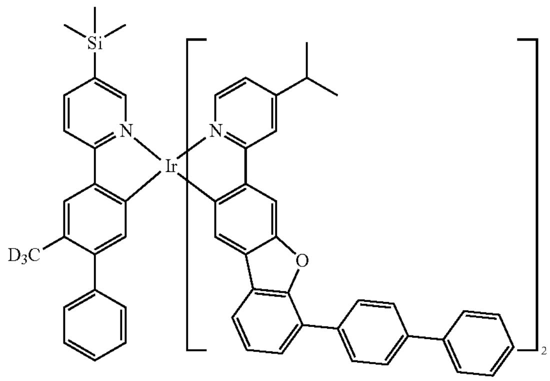
4725
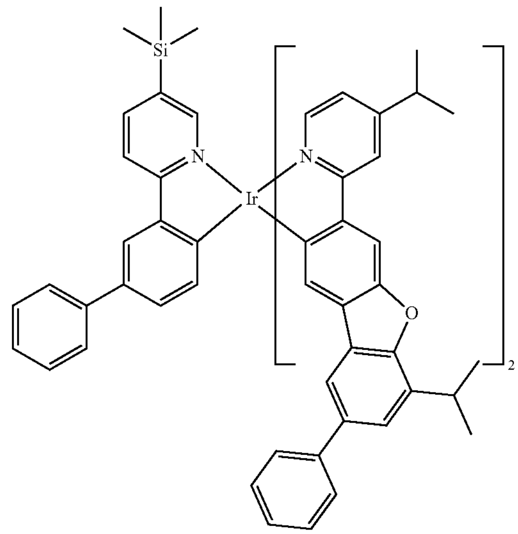
4726
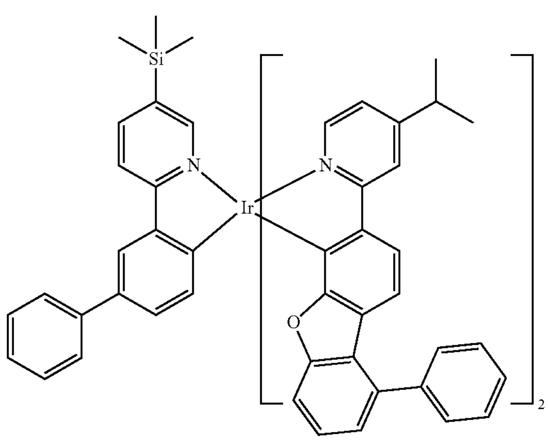
4727
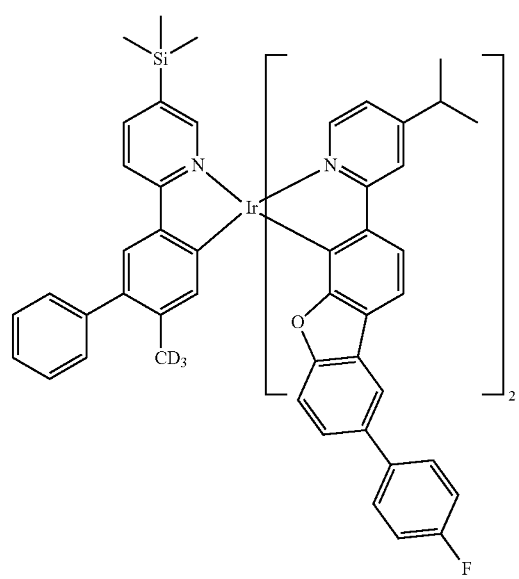

-continued
4728
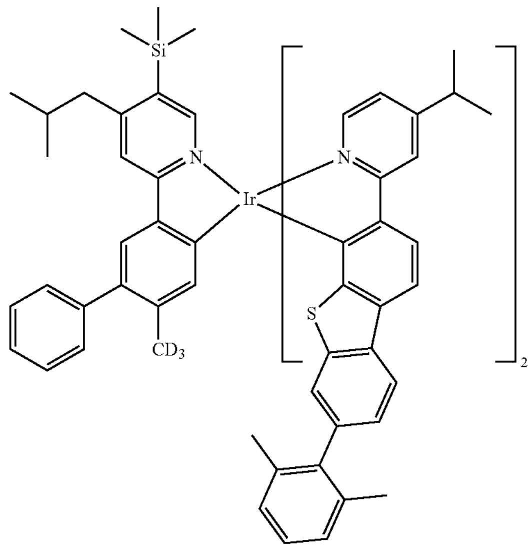
4729
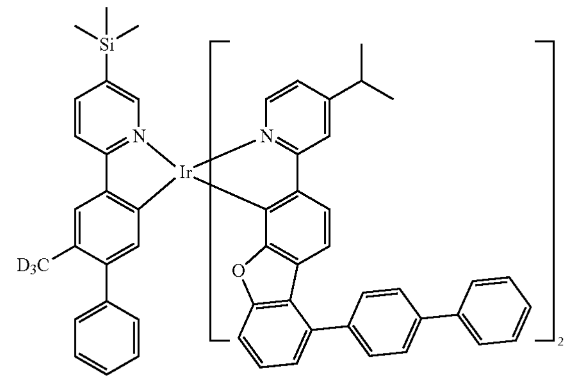
4730
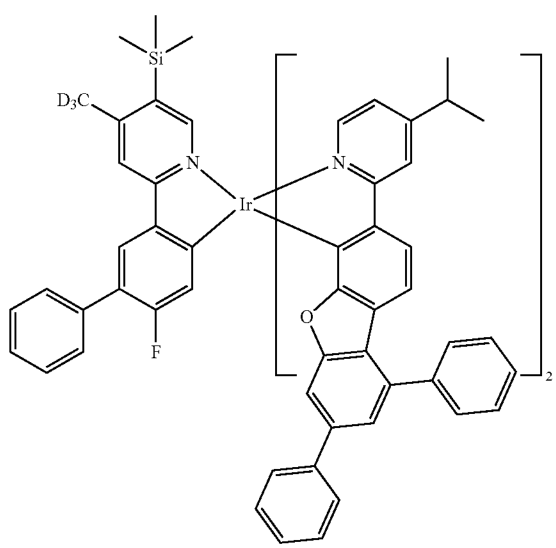
4731
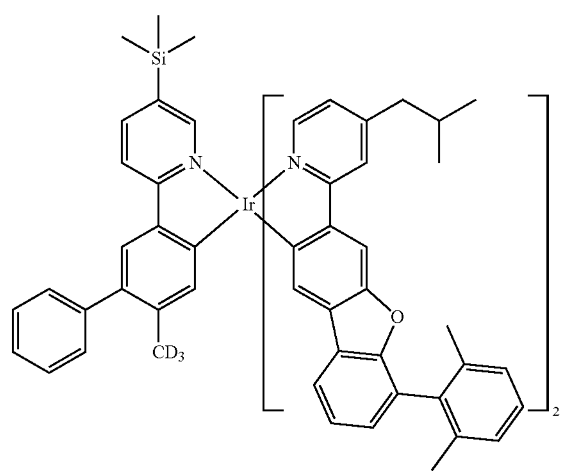

-continued
4732
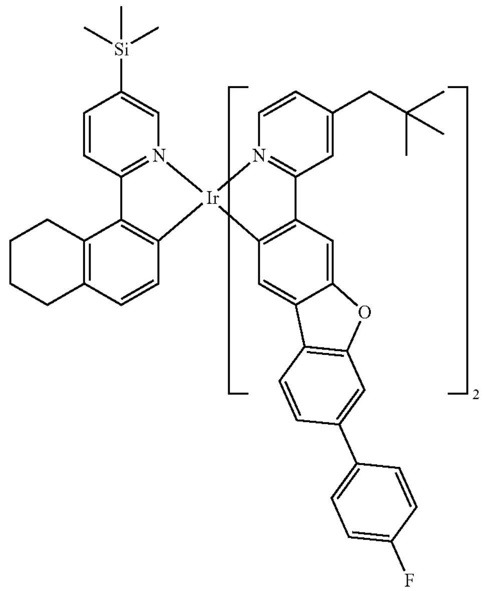
4733
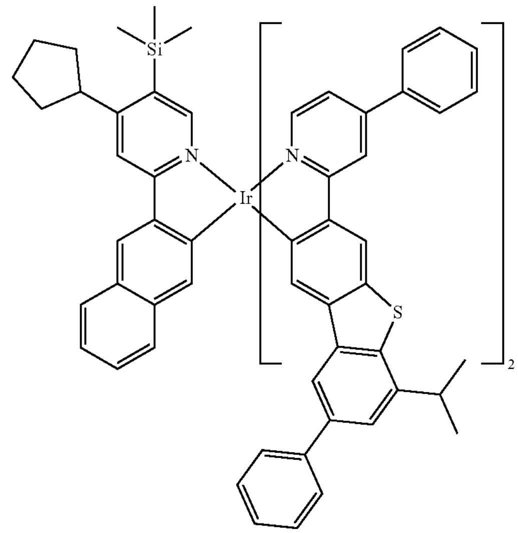
4734
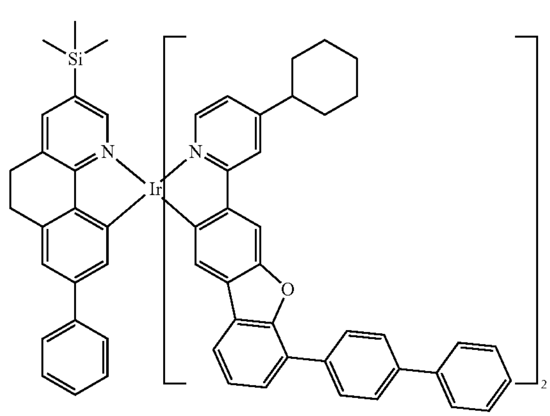
4735
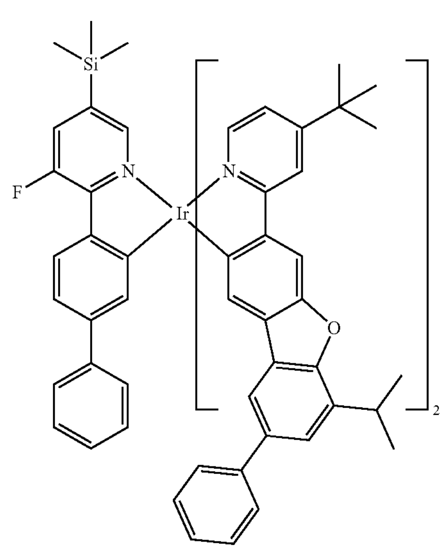

-continued
4736
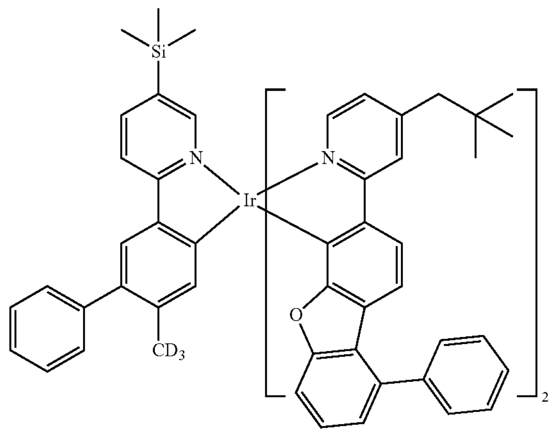
4737
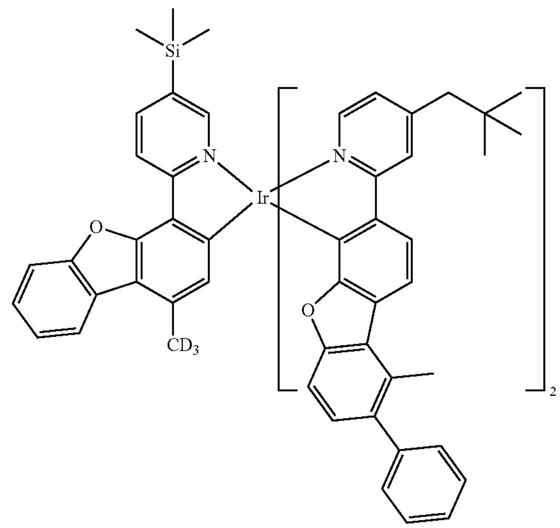
4738
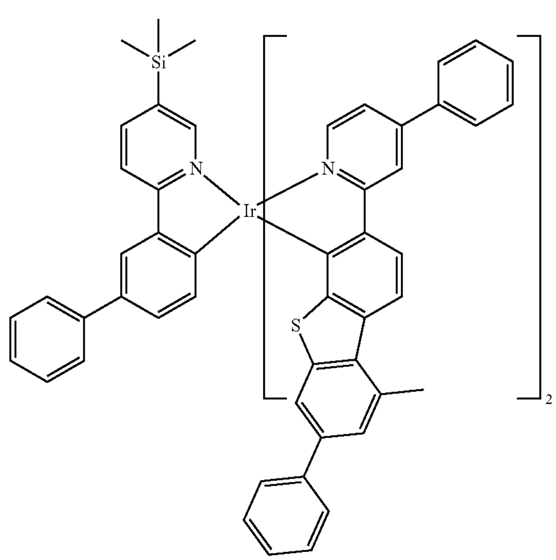
4739
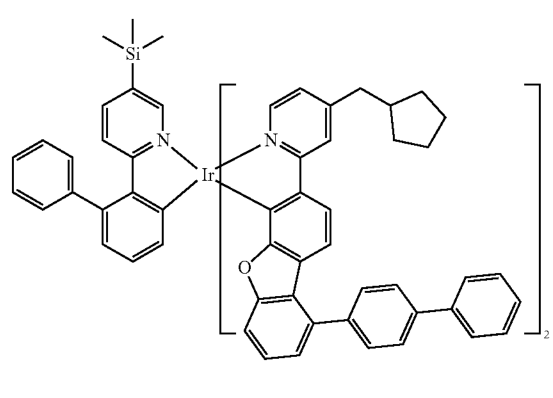

-continued
4740
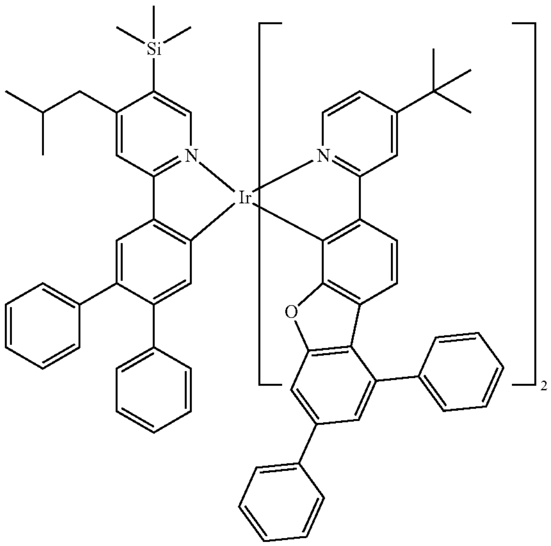
4741
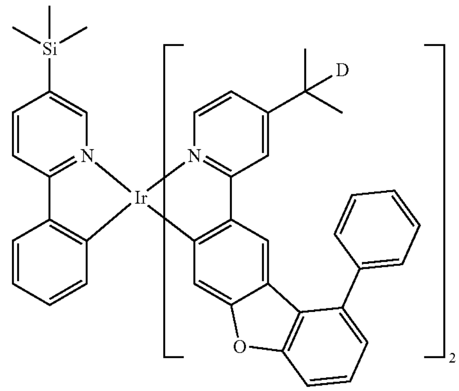
4742
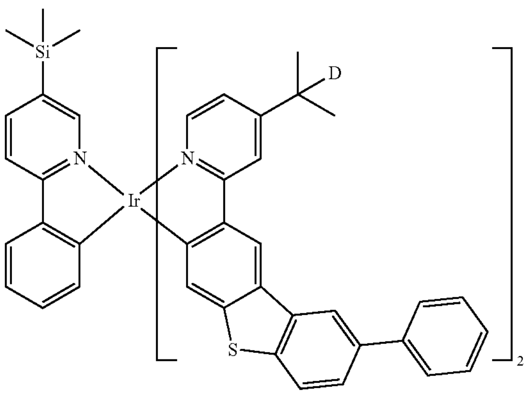
4743
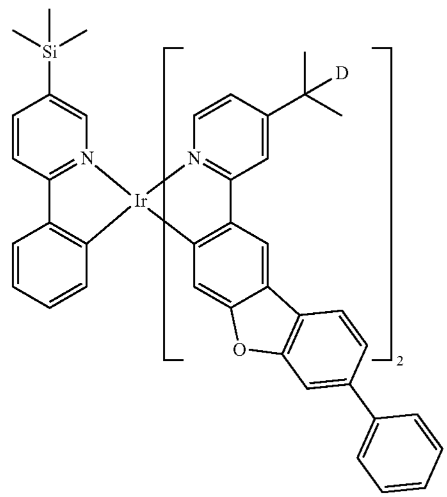
4744
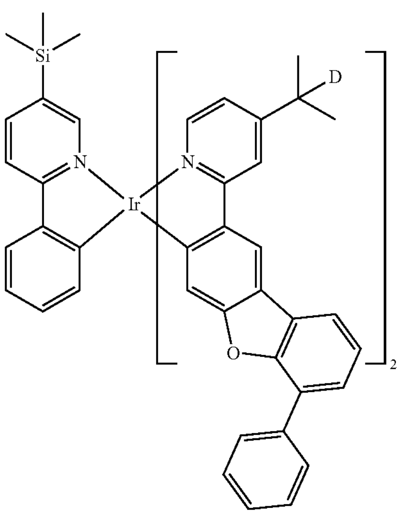
4745
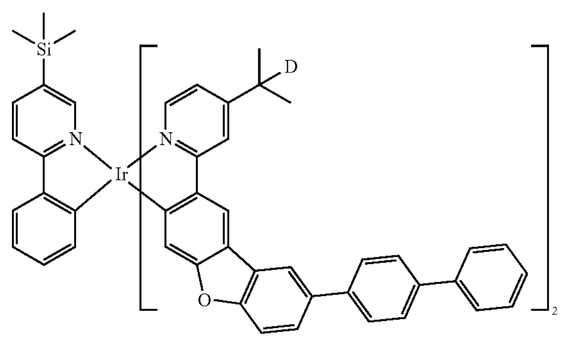

-continued
4746
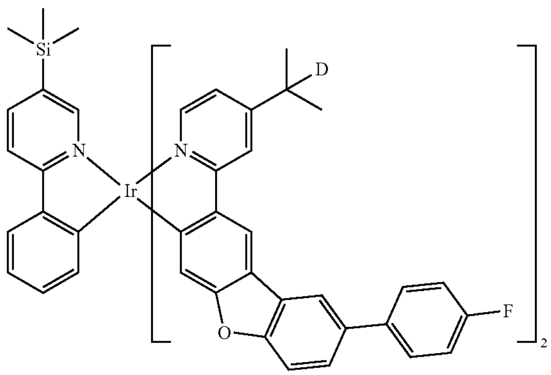
4747
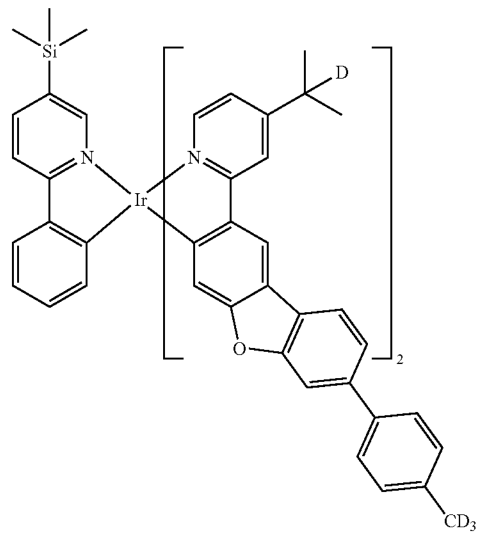
4748
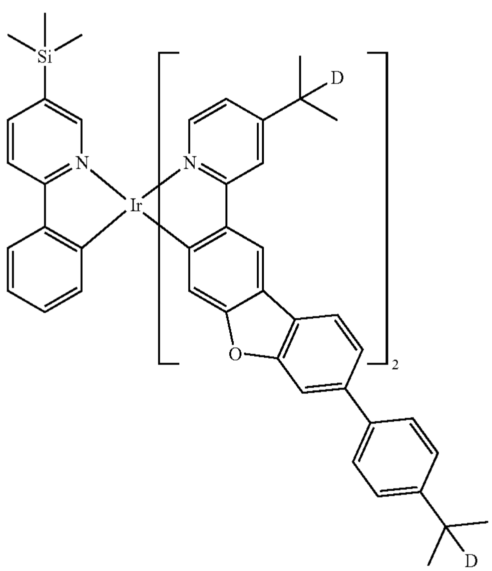
4749
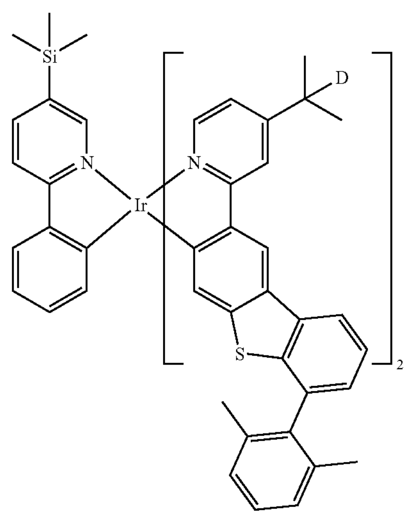
4750
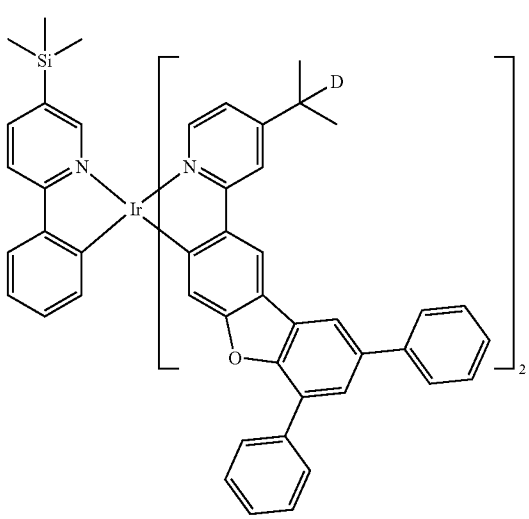
4751
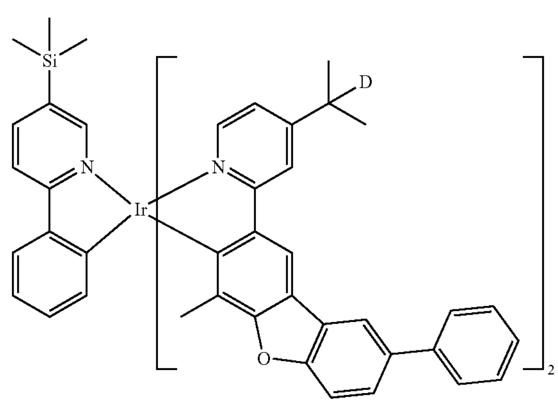

-continued
4752
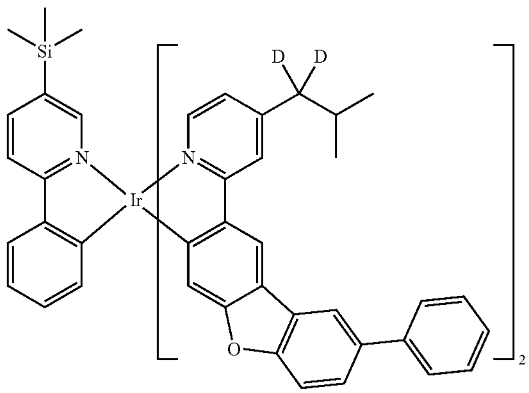
4753
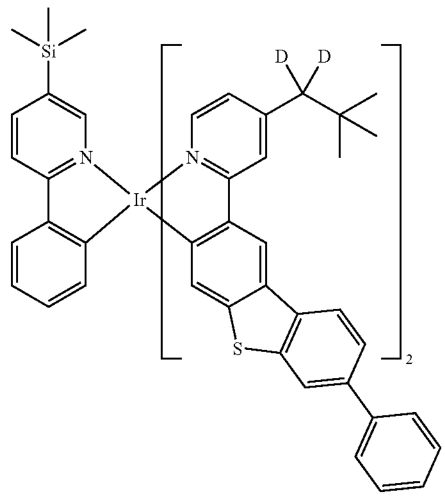
4754
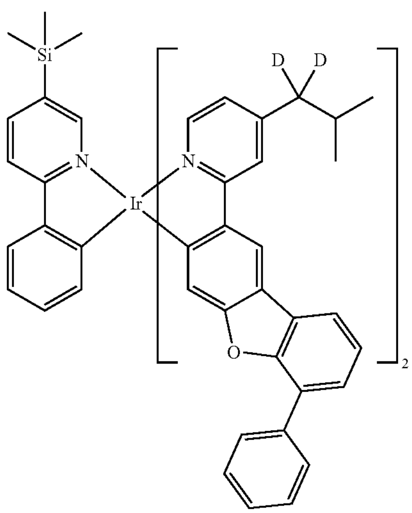
4755
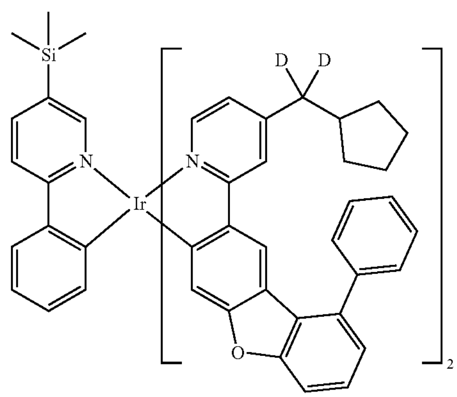
4756
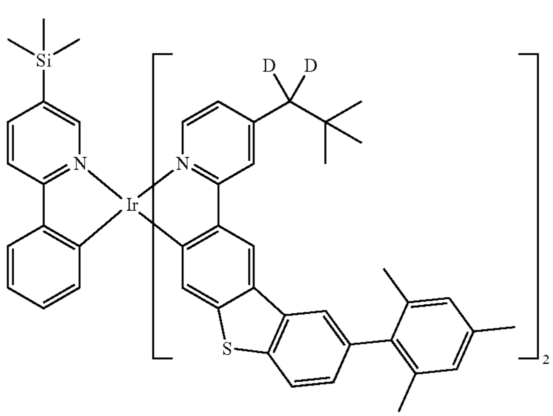
4757
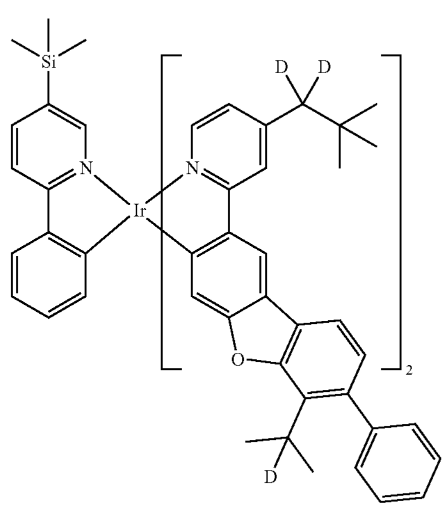

-continued
4758
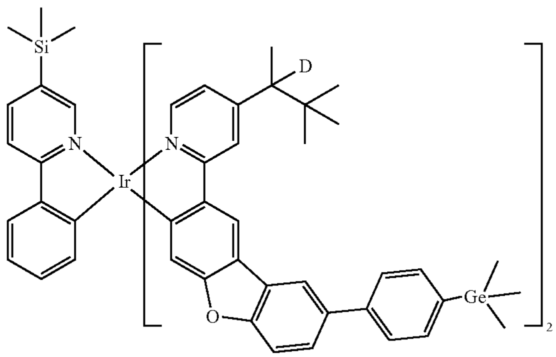
4759
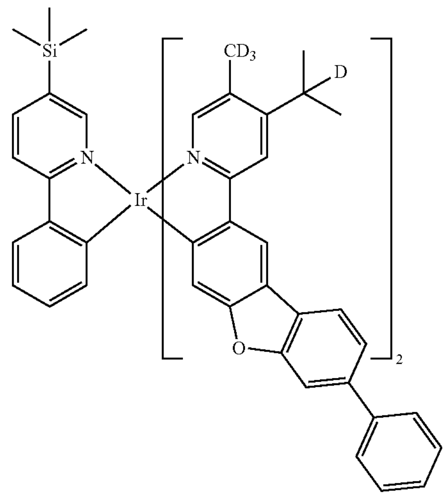
4760
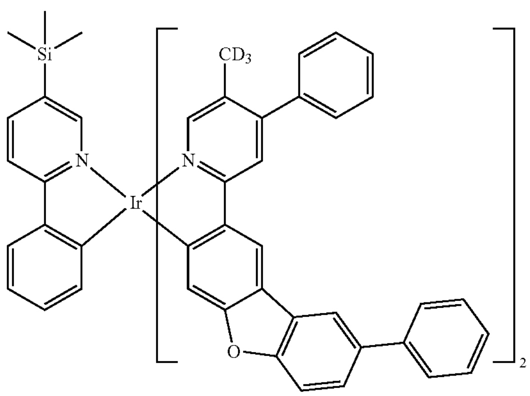
4761
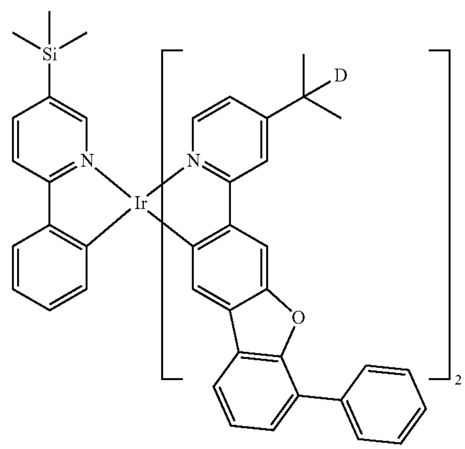
4762
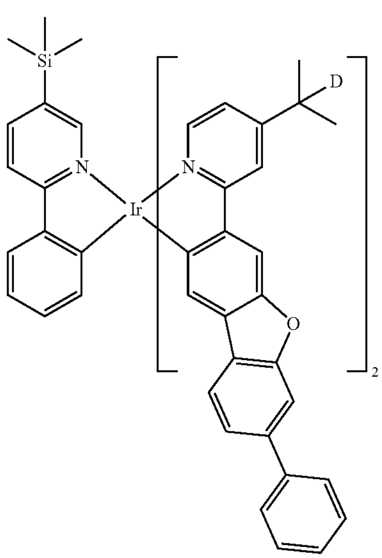
4763
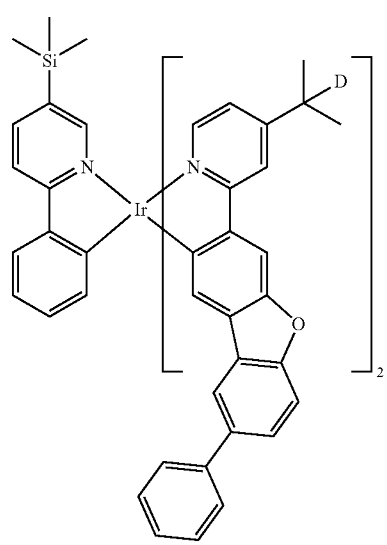

-continued
4764
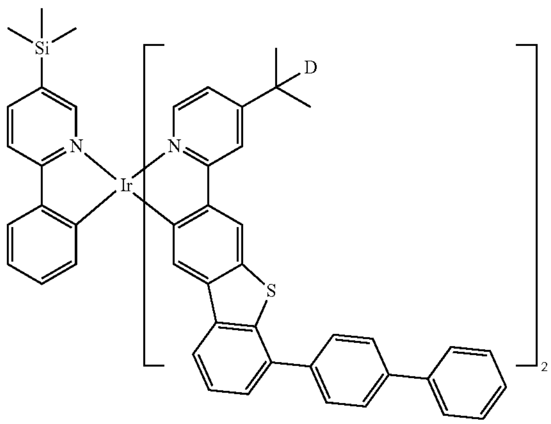
4765
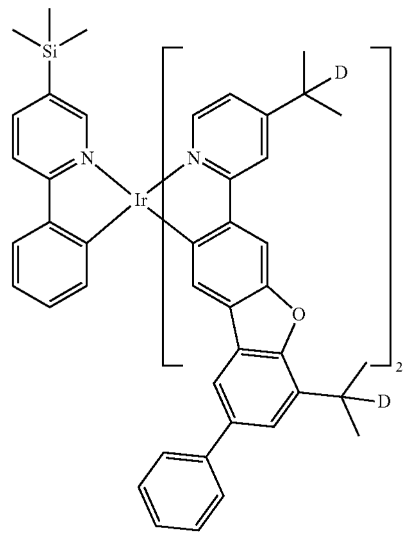
4766
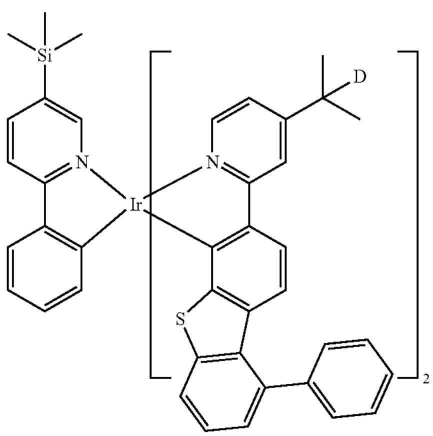
4767
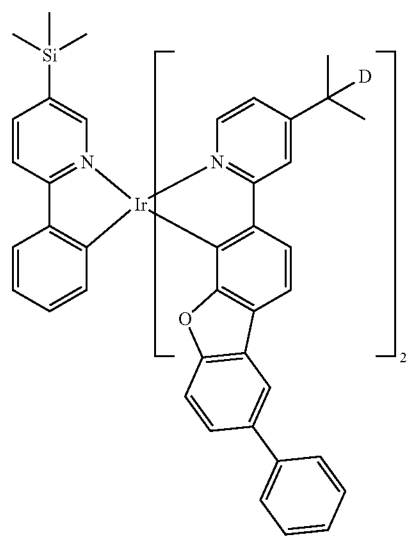
4768
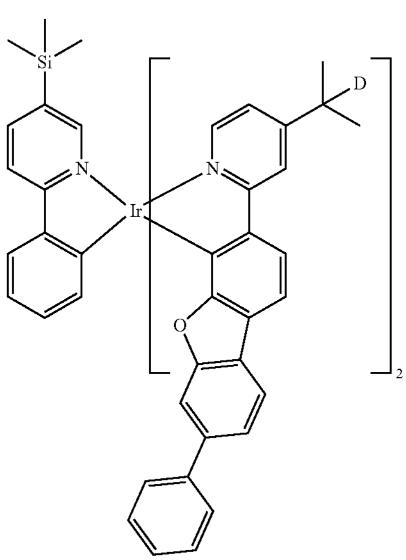
4769
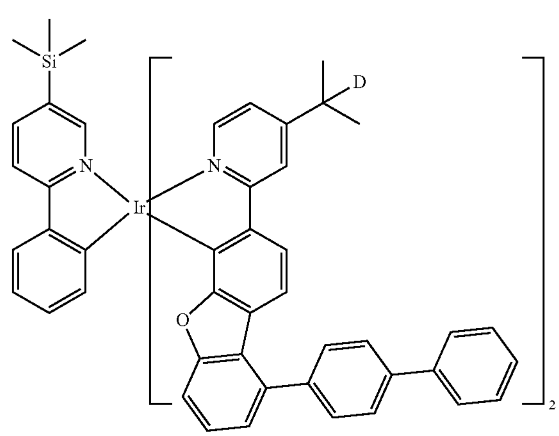

-continued
4770
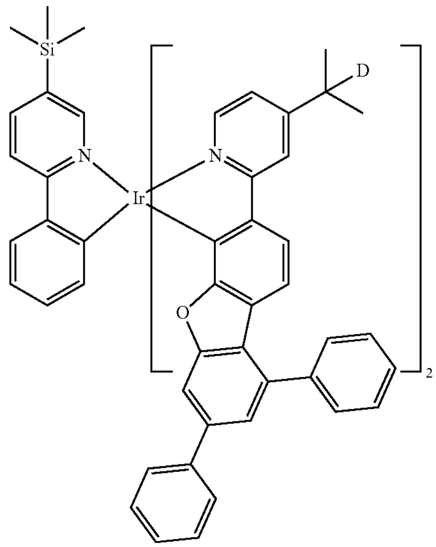
4771
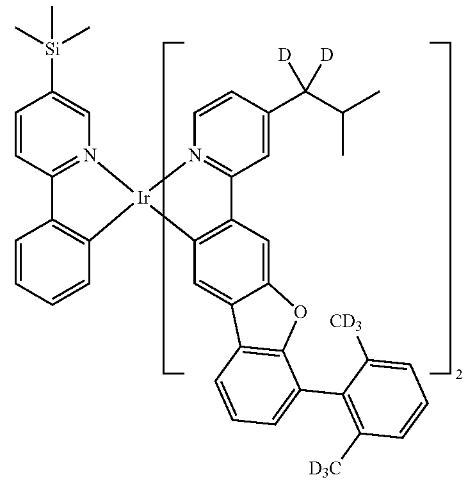
4772
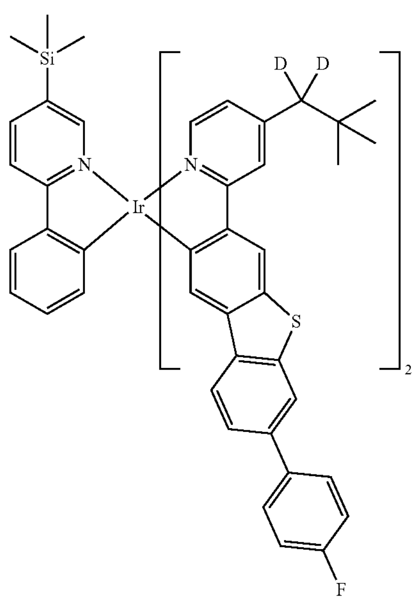
4773
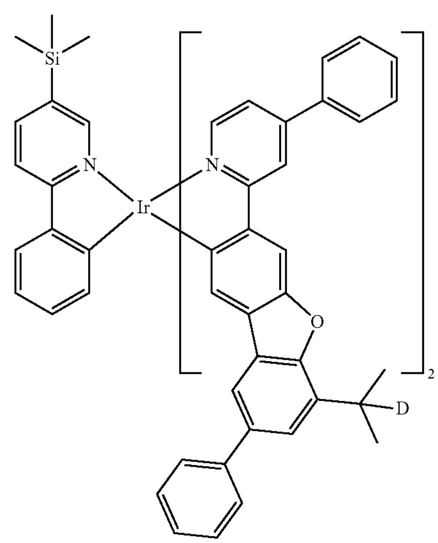

-continued
4774
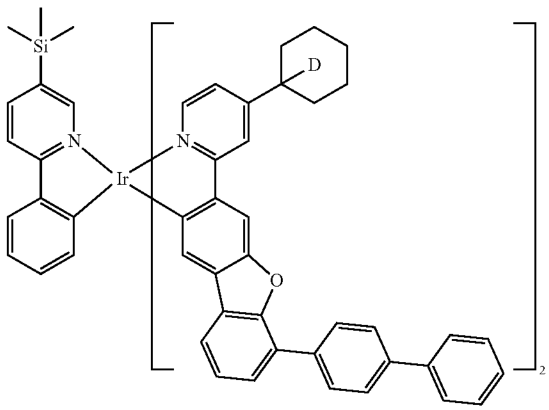
4775
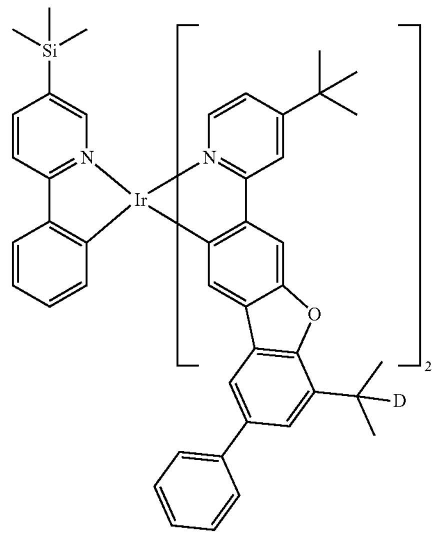
4776
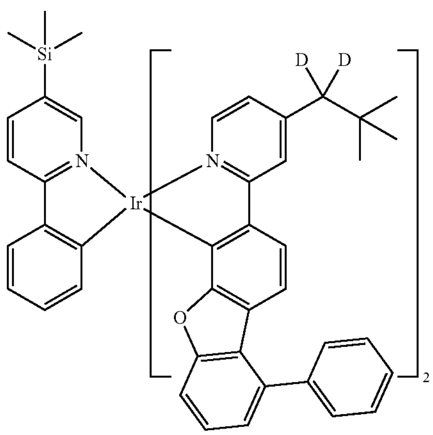
4777
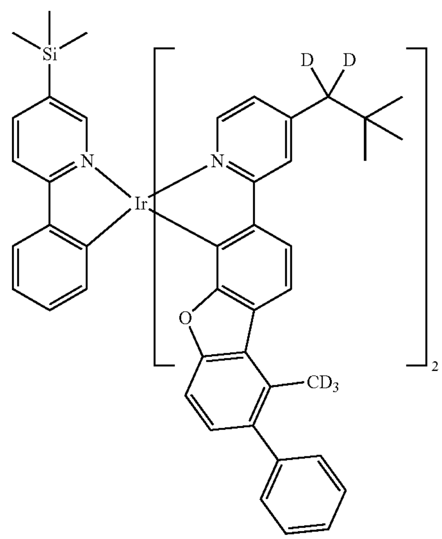
4778
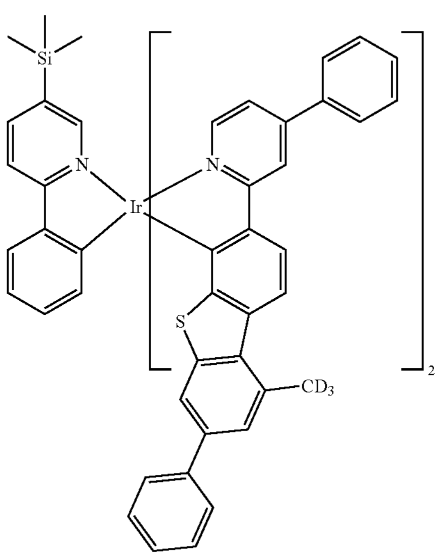
4779
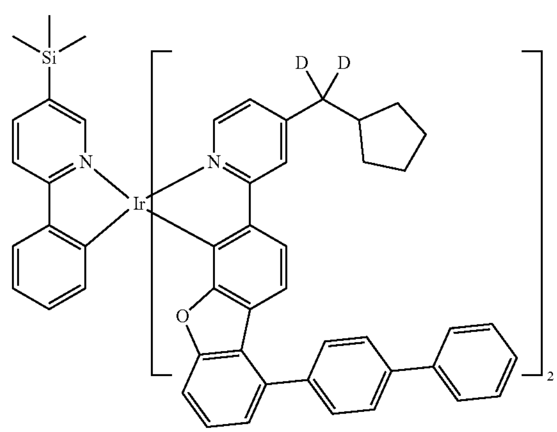

-continued
4780
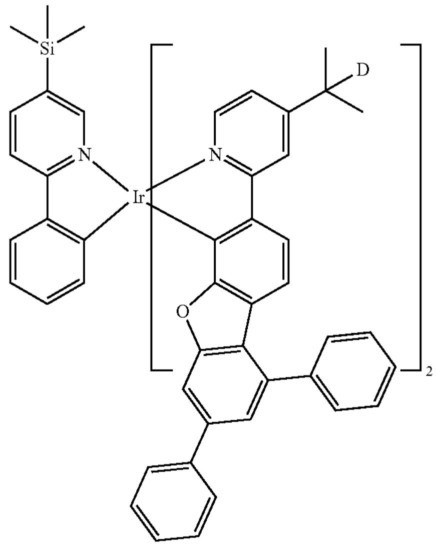
4781
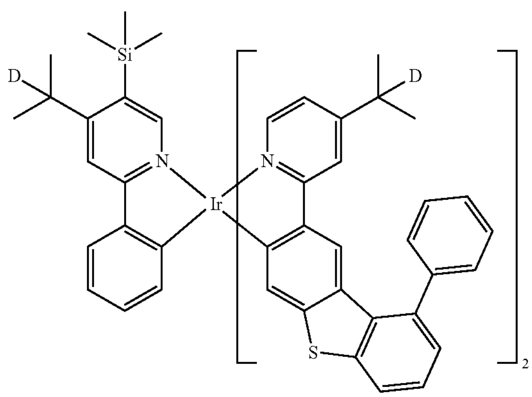
4782
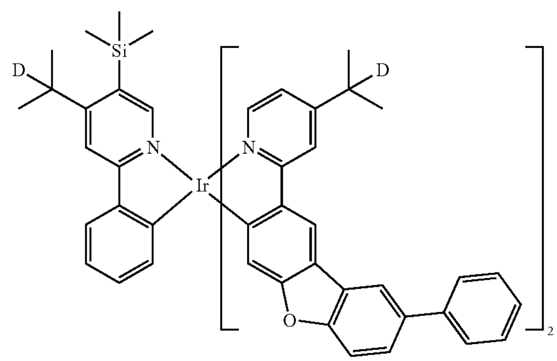
4783
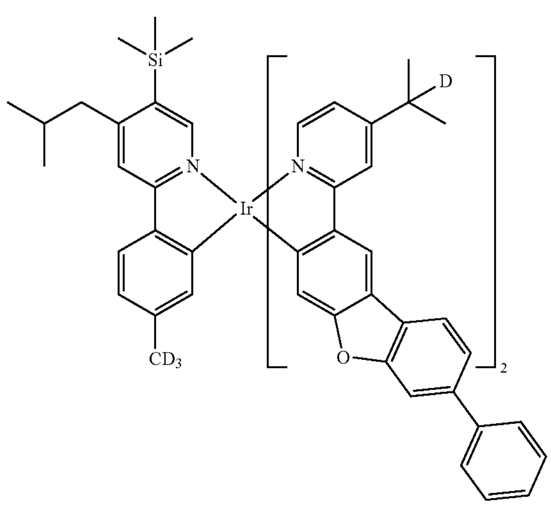
4784
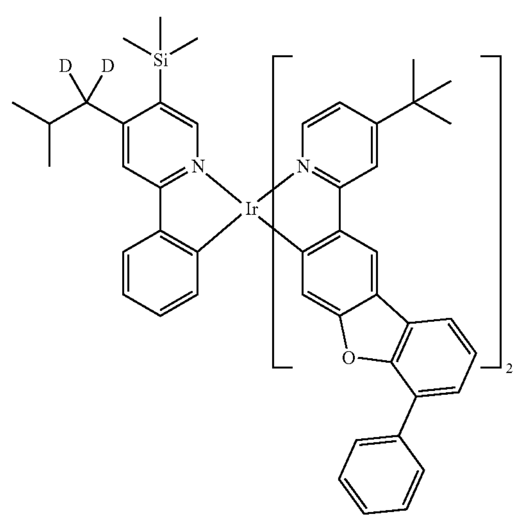

-continued
4785
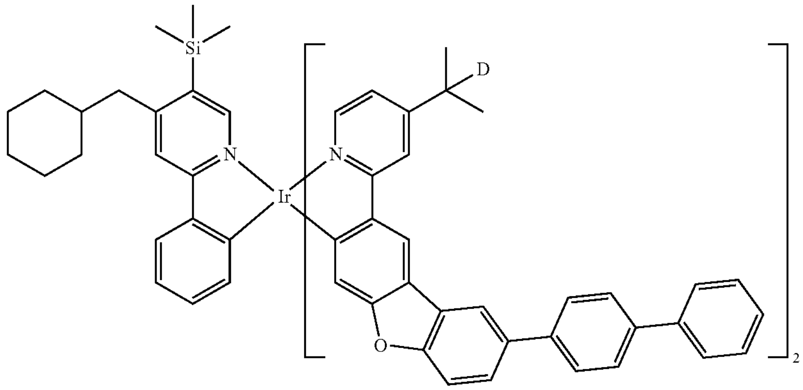
4786
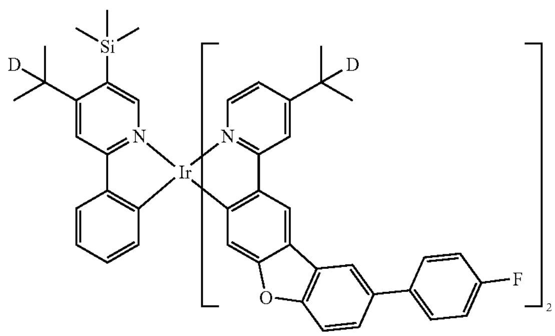
4787
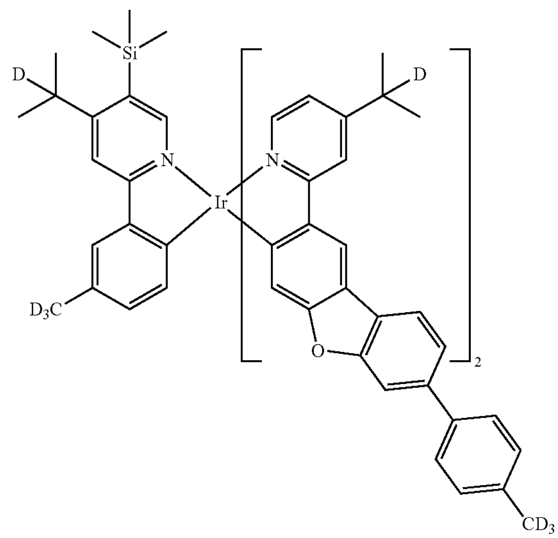
4788
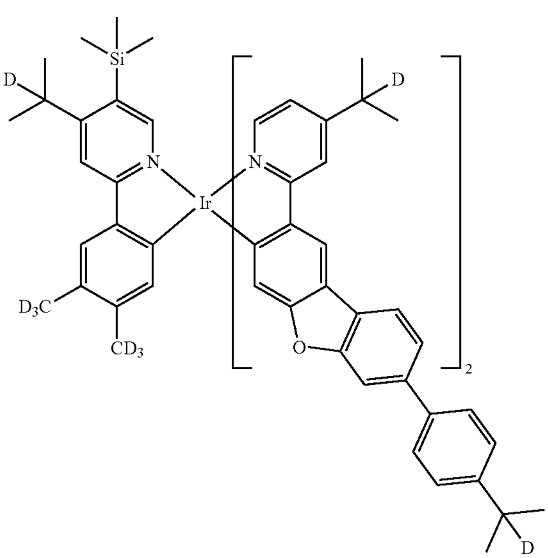
4789
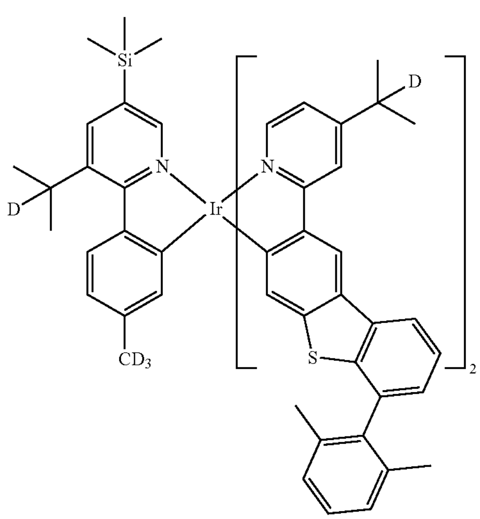

-continued
4790
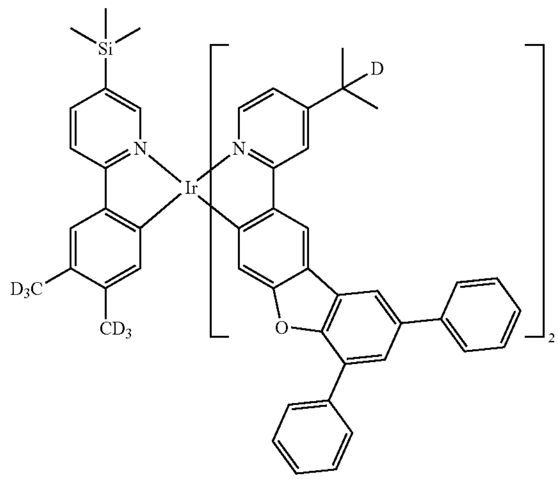
4791
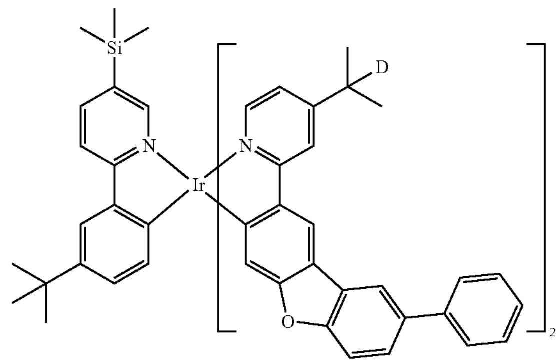
4792
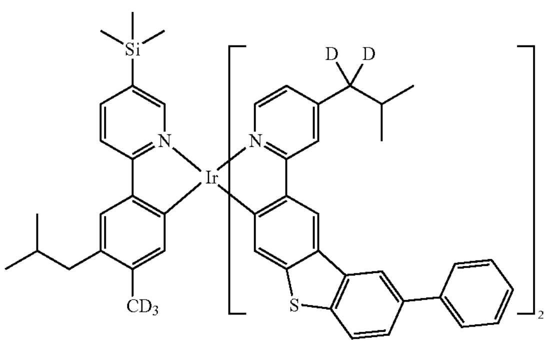
4793
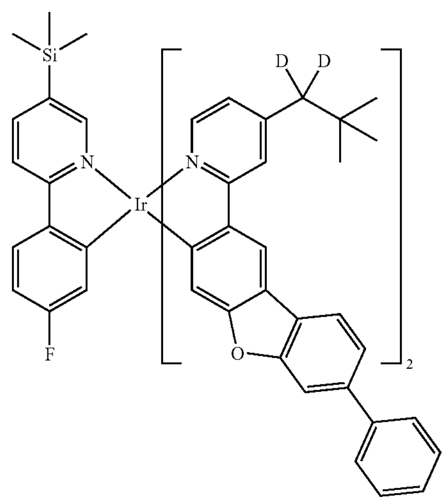
4794
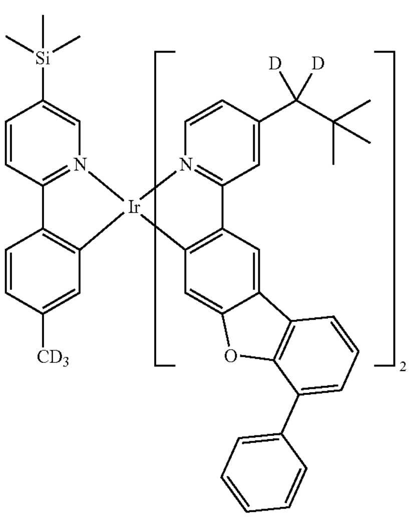
4795
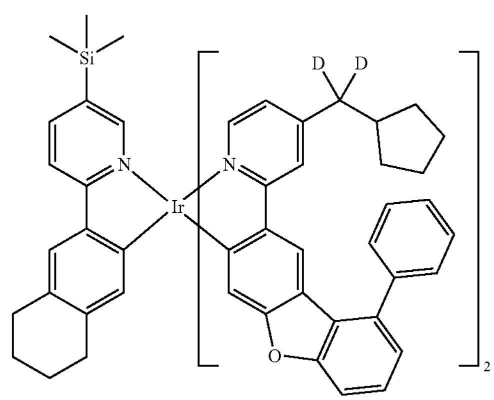

-continued
4796
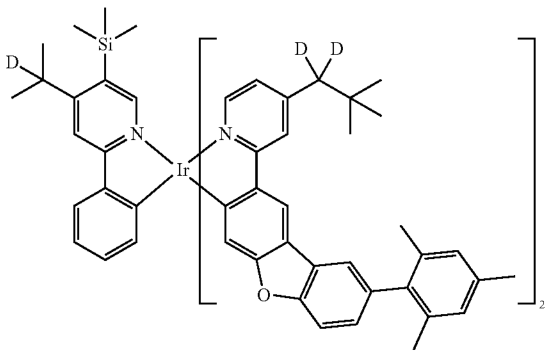
4797
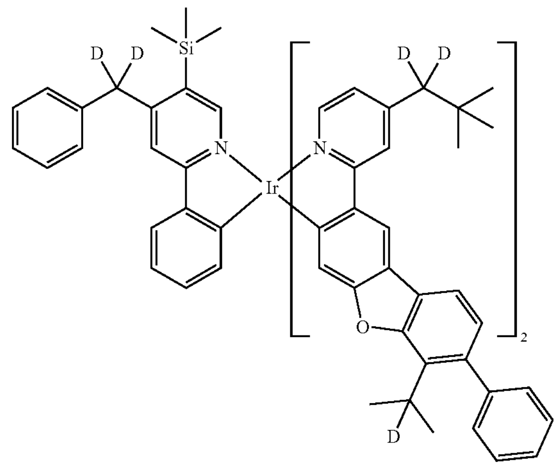
4798
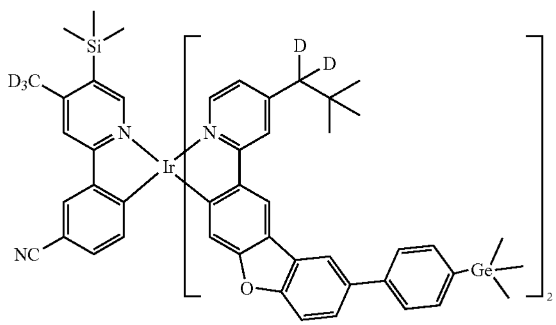
4799
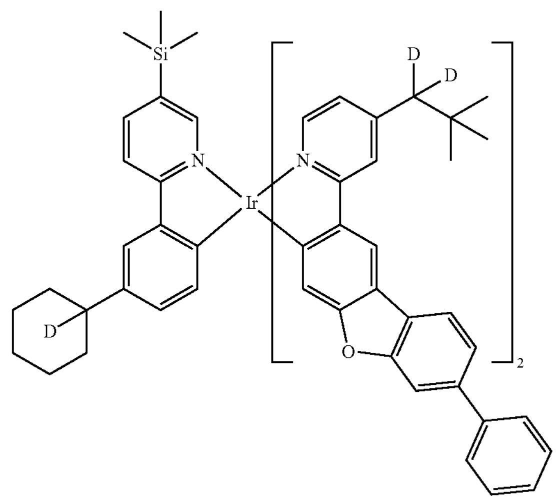
4800
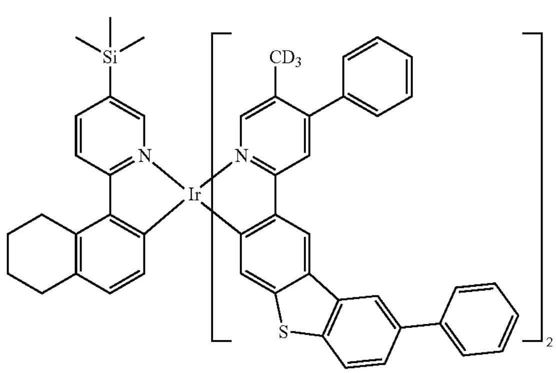
4801
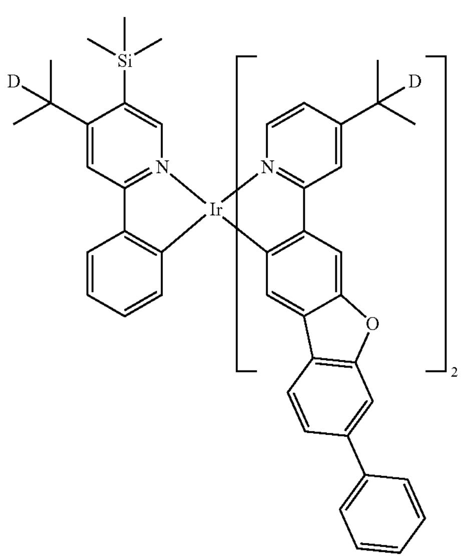

-continued
4802
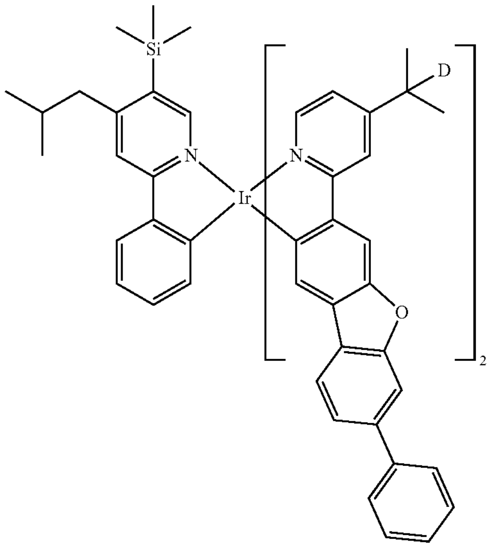
4803
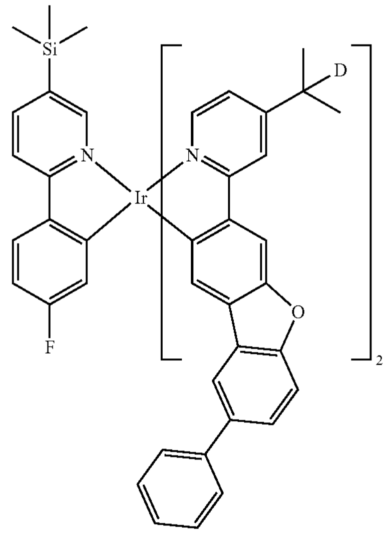
4804
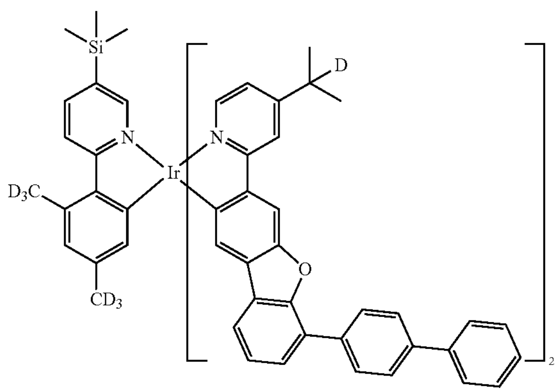
4805
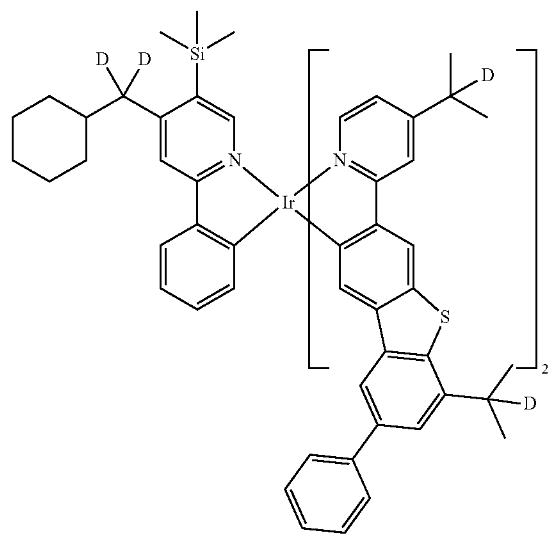
4806
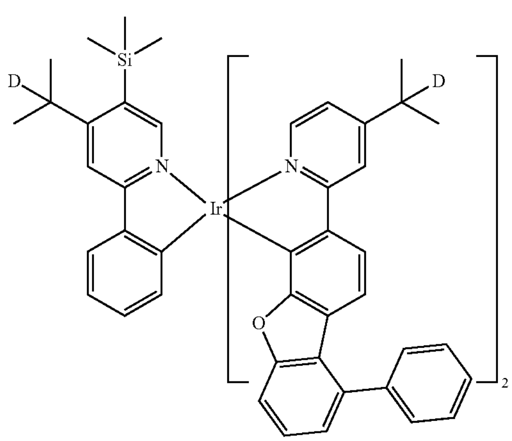
4807
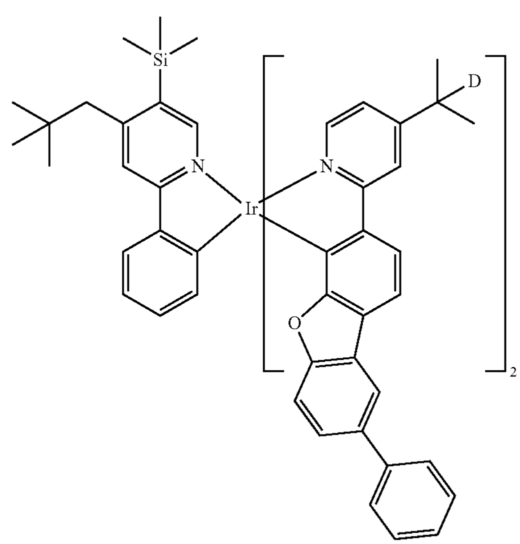

-continued
4808
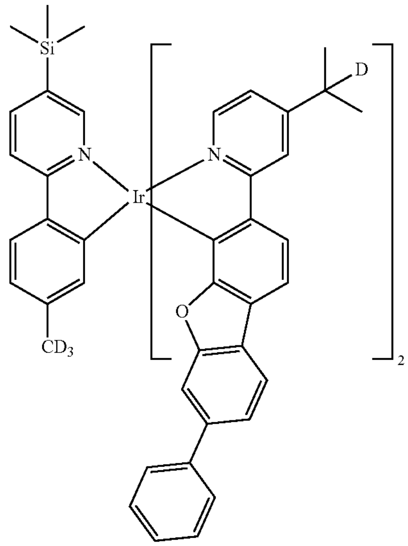
4809
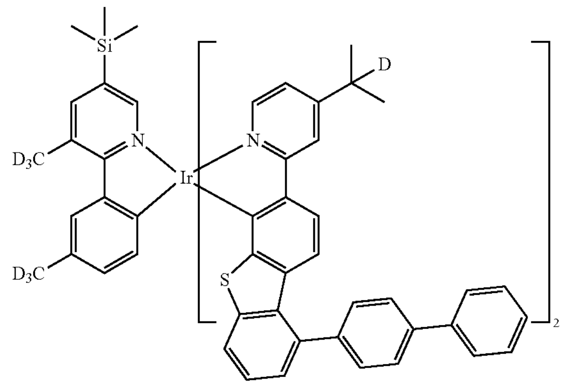
4810
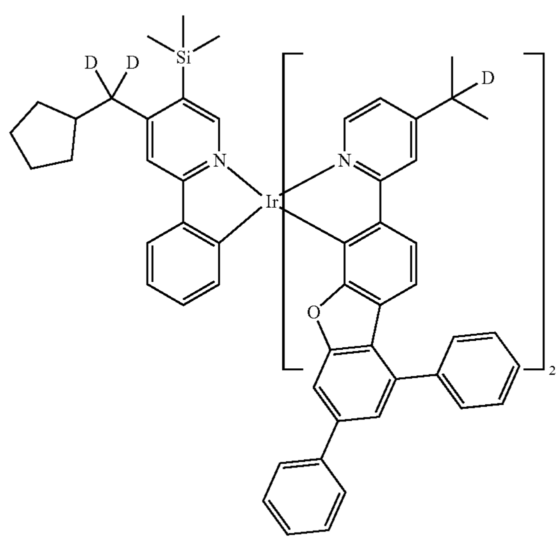
4811
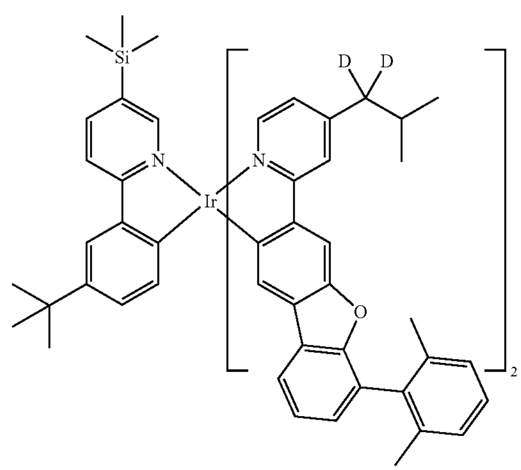

-continued
4812
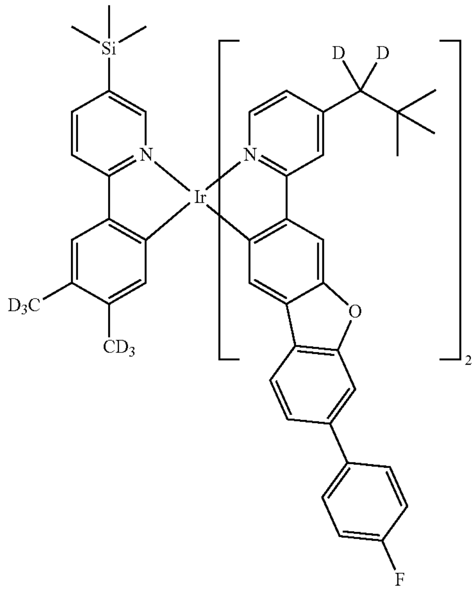
4813
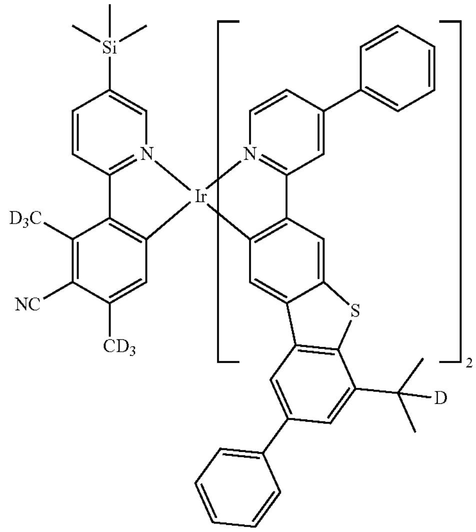
4814
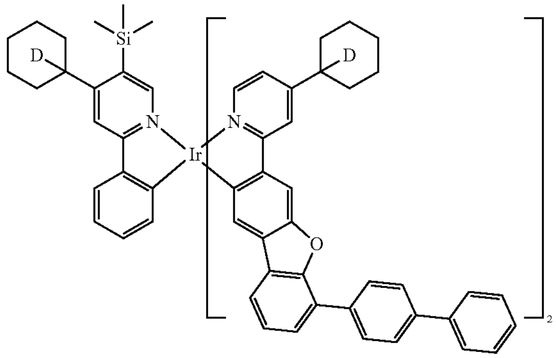
4815
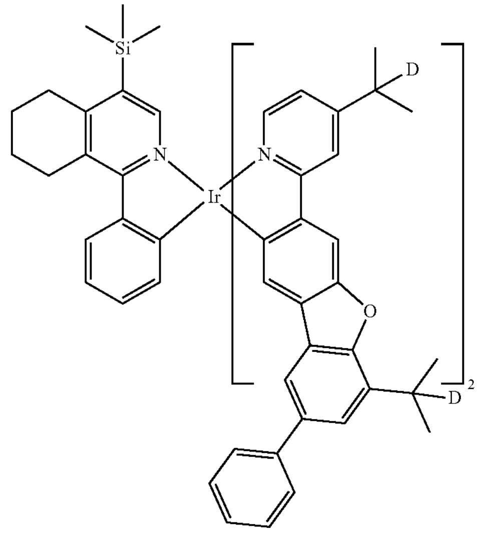

-continued
4816
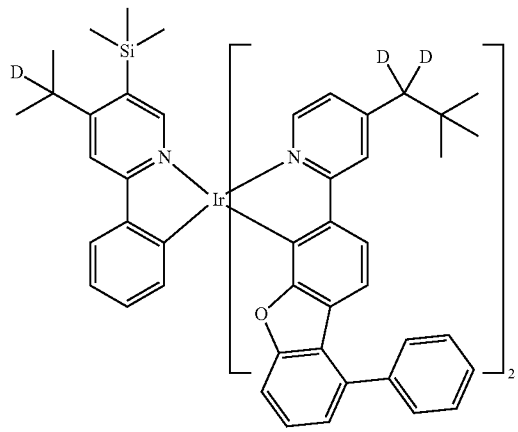
4817
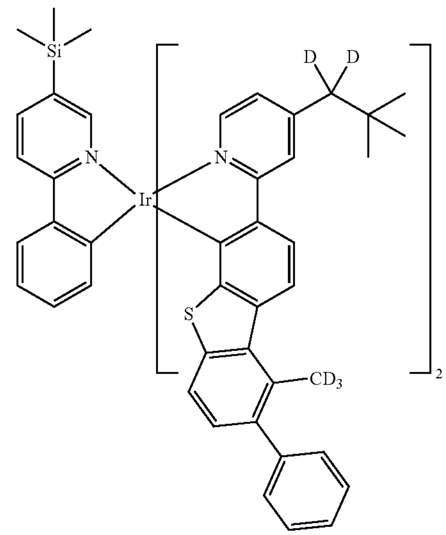
4818
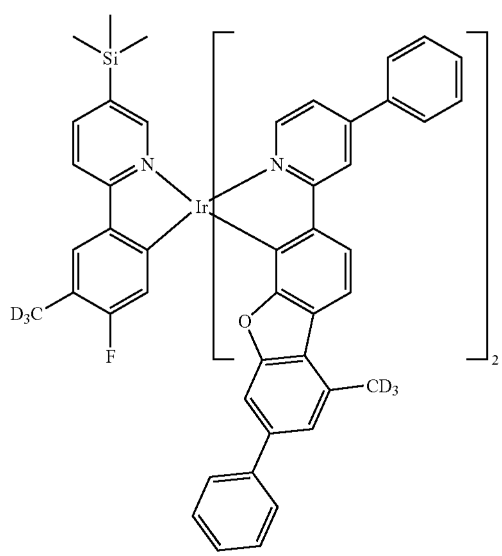
4819
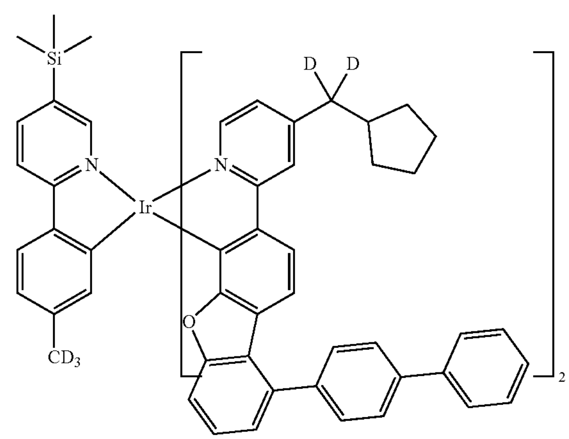
4820
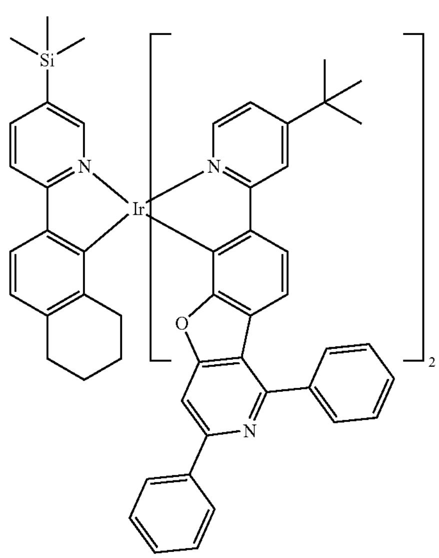
4821
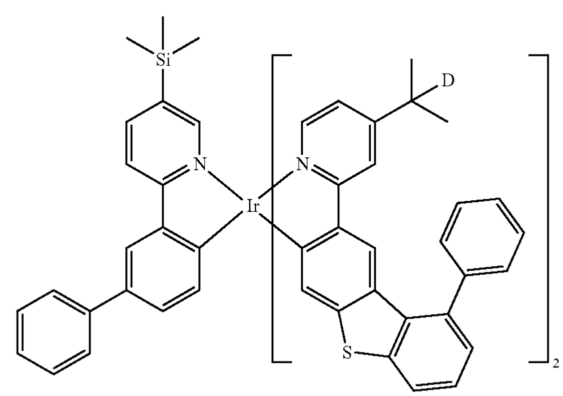

-continued
4822
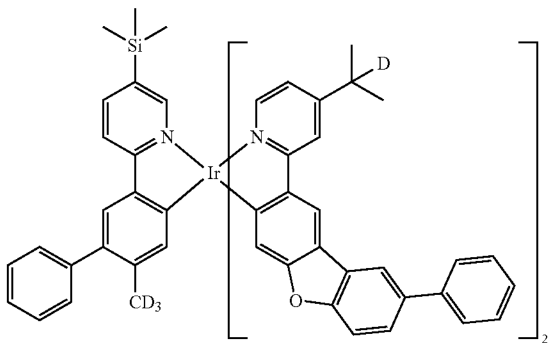
4823
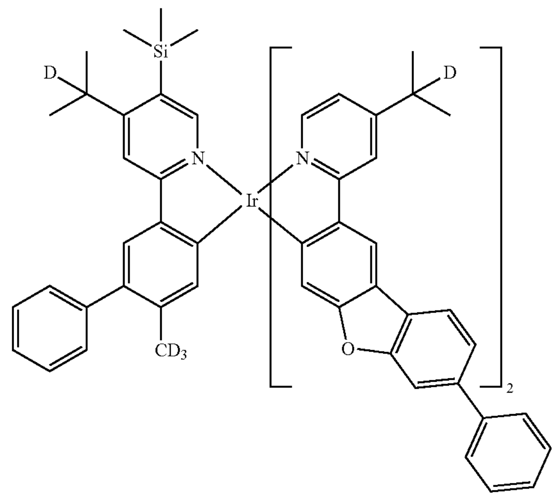
4824
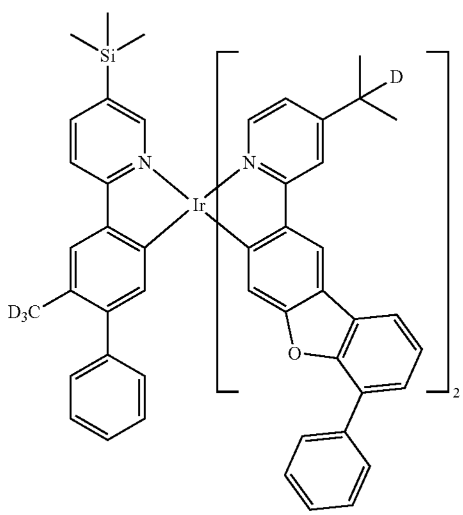
4825
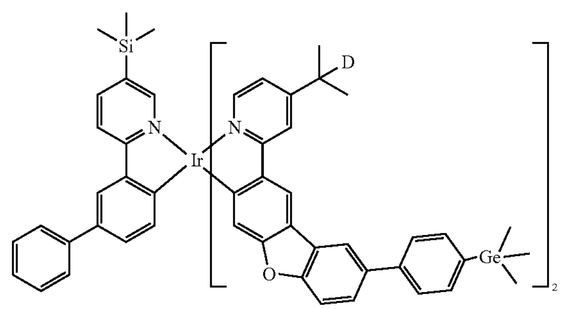
4826
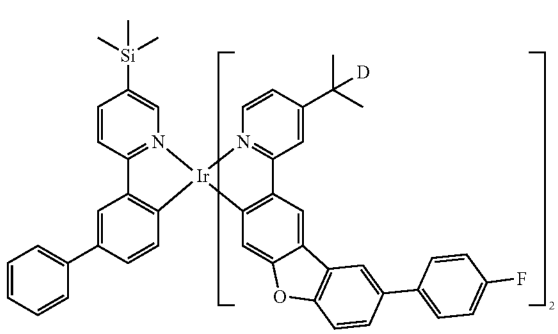
4827
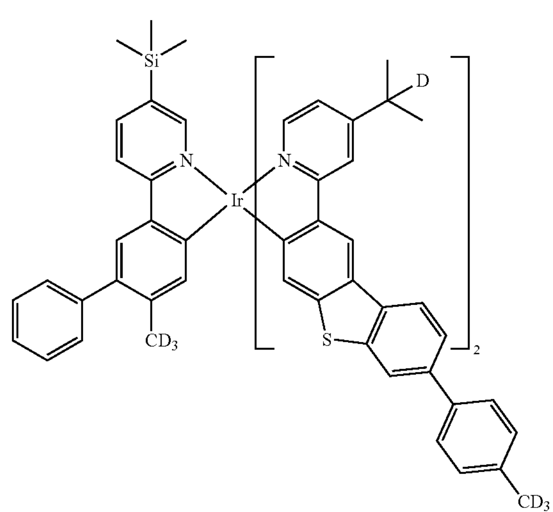

-continued
4828
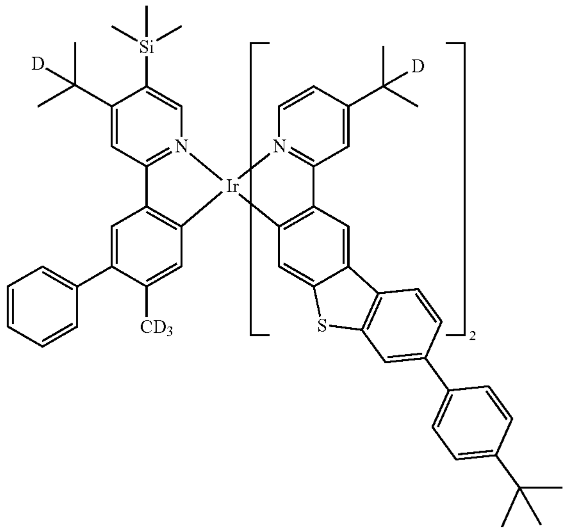
4829
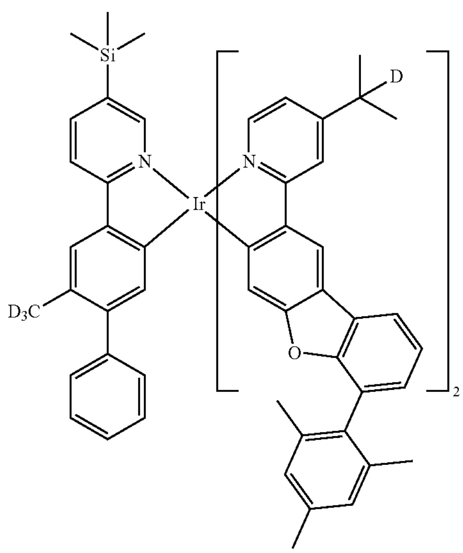
4830
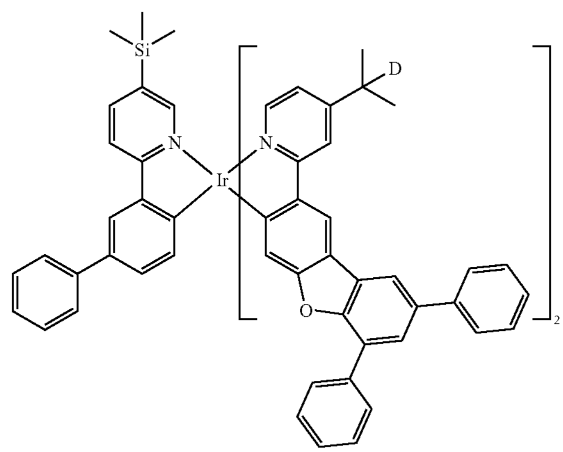
4831
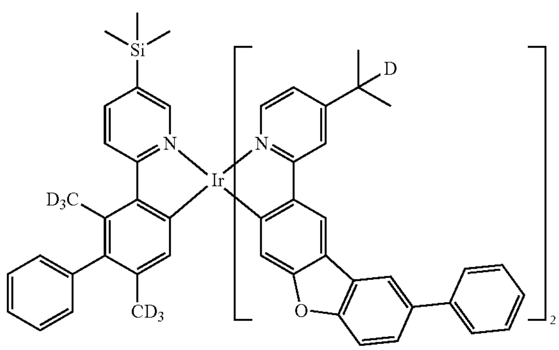
4832
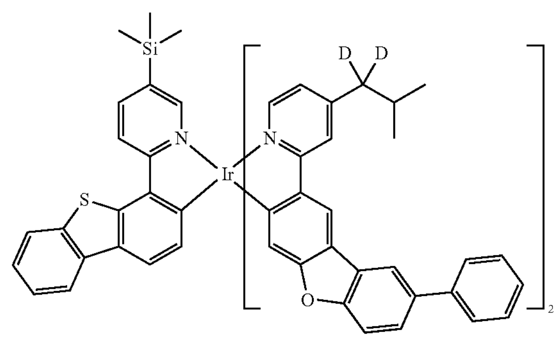

-continued
4833
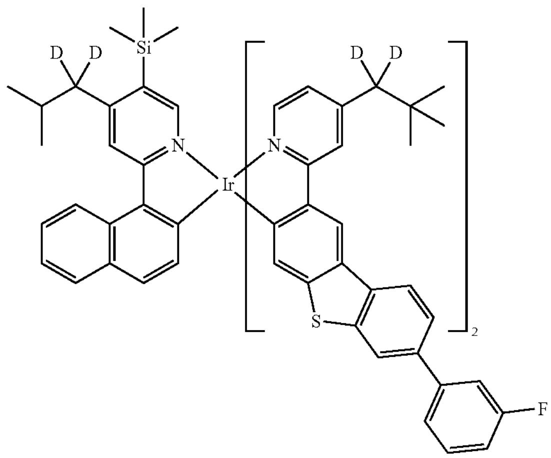
4834
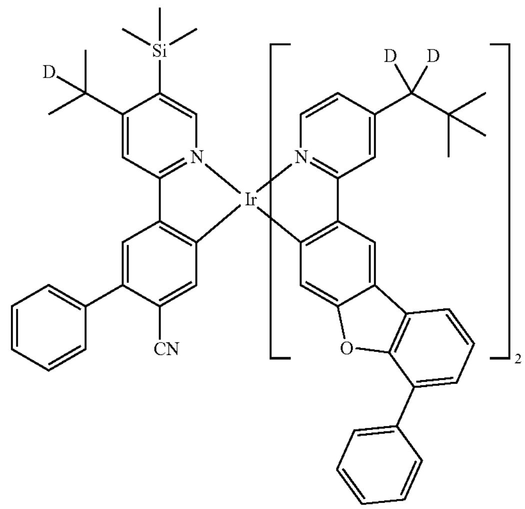
4835
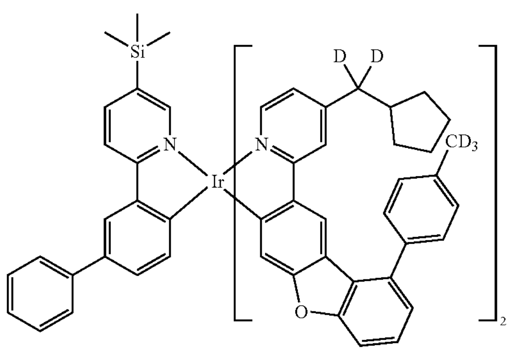
4836
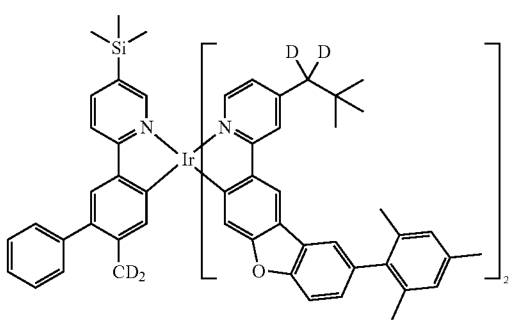
4837
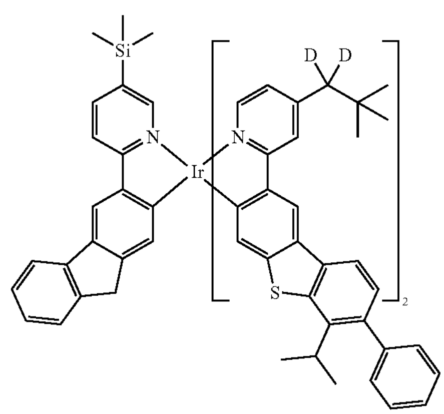

-continued
4838
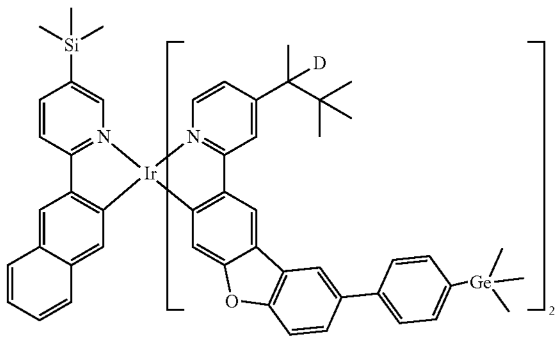
4839
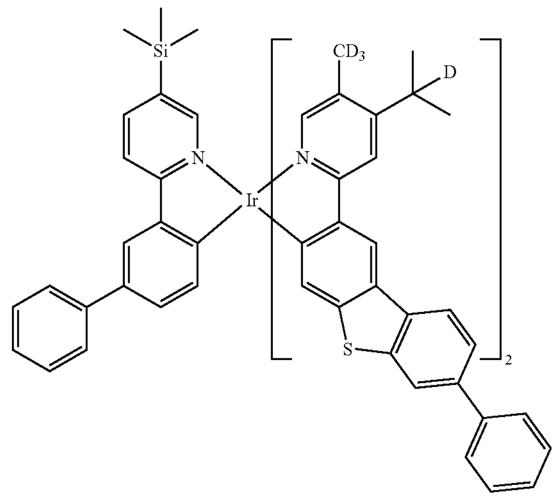
4840
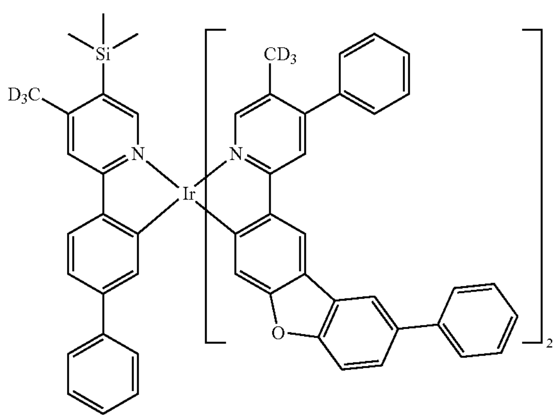
4841
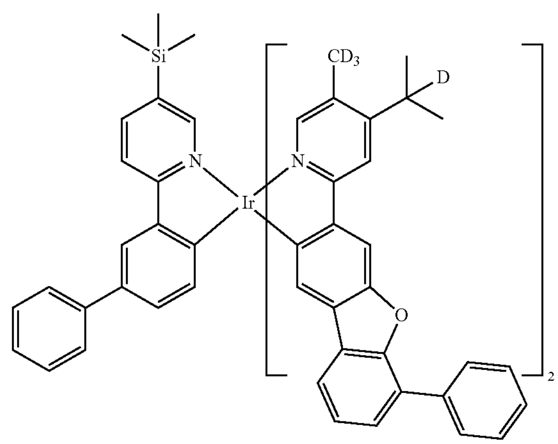
4842
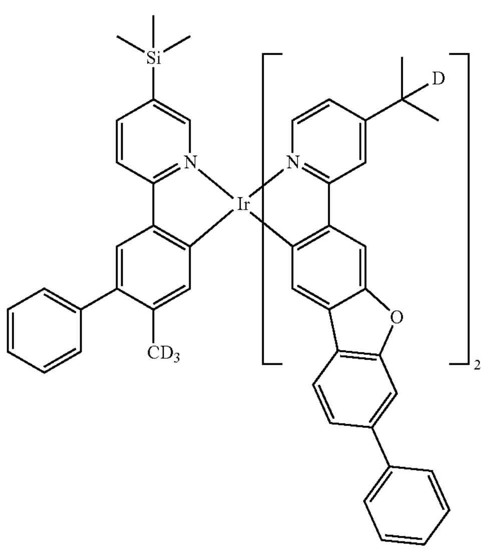
4843
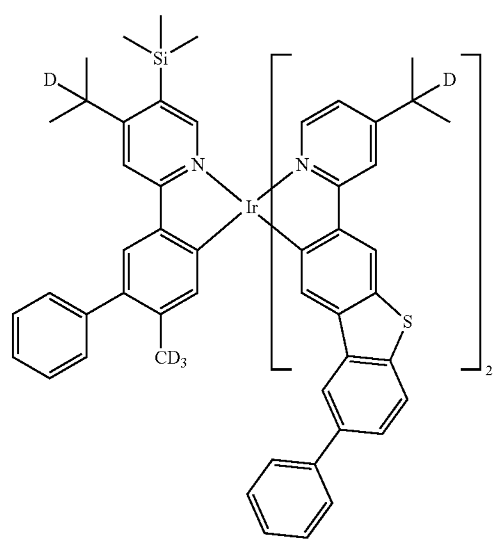

-continued
4844
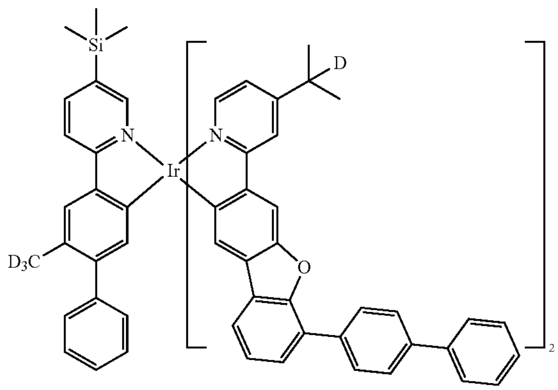
4845
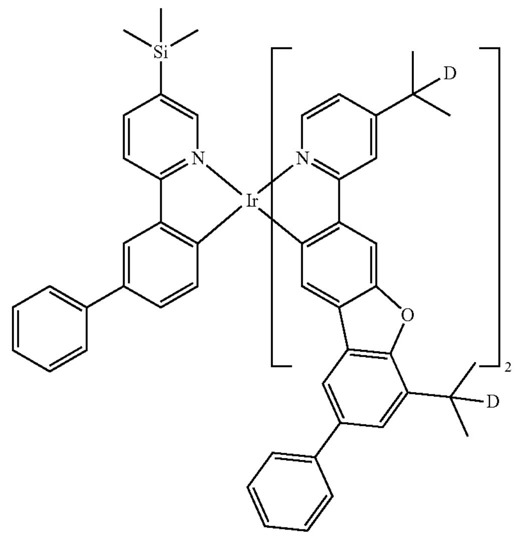
4846
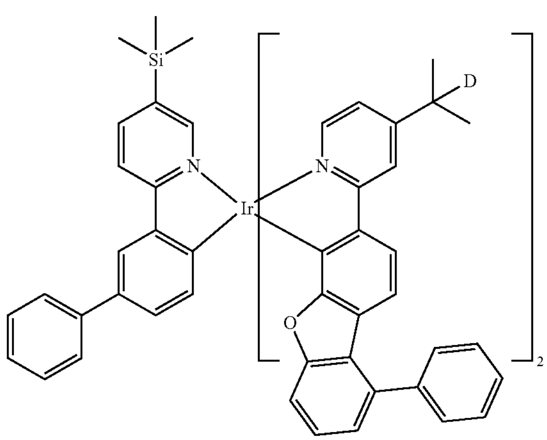
4847
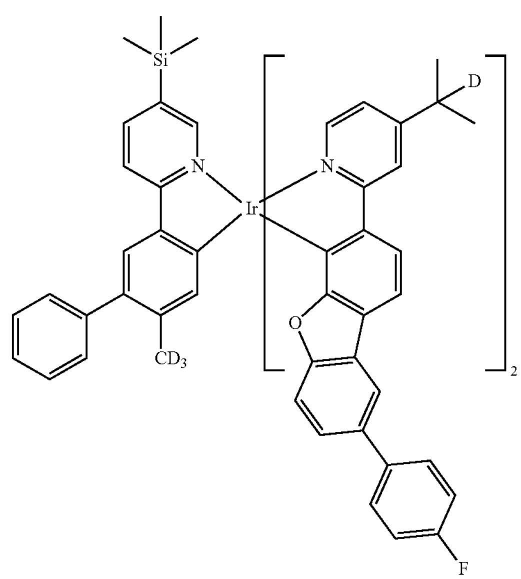

-continued
4848
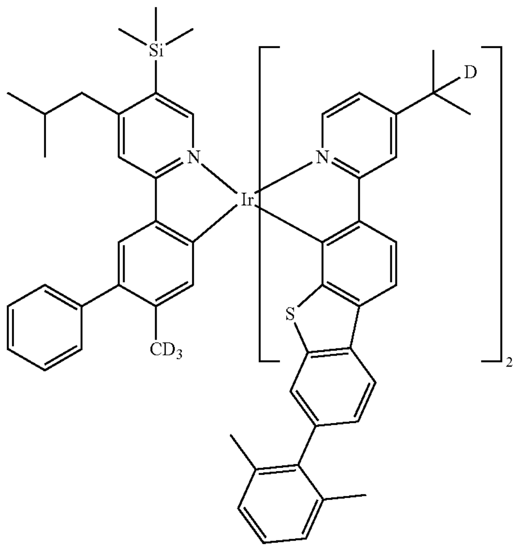
4849
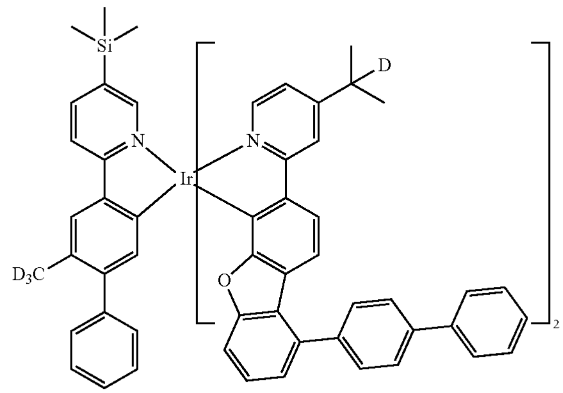
4850
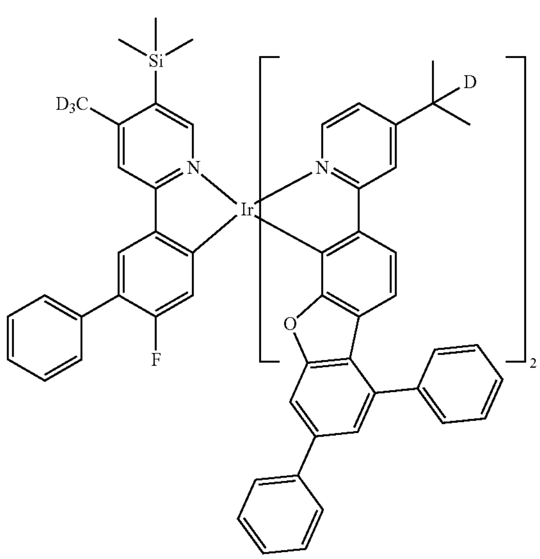
4851
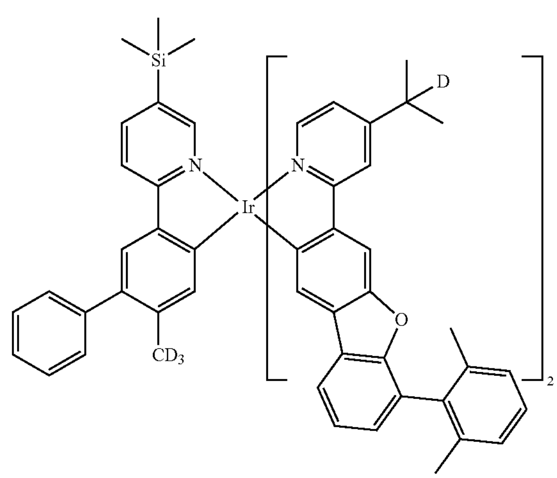

-continued
4852
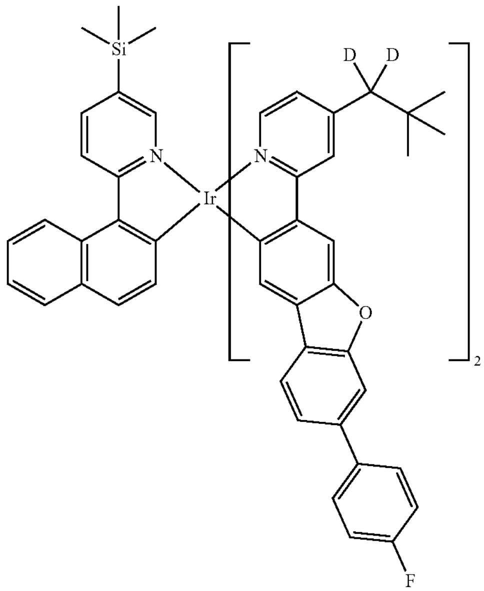
4853
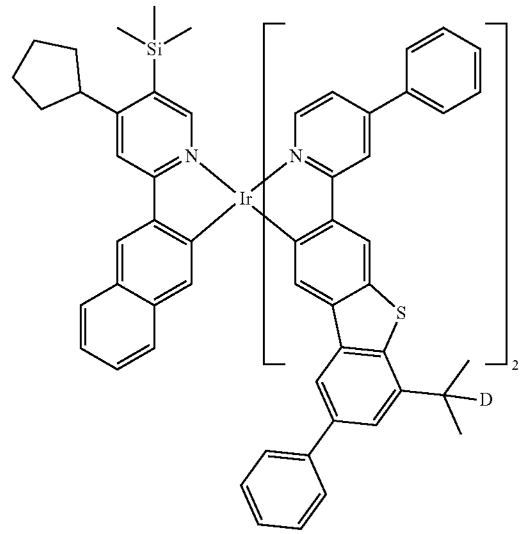
4854
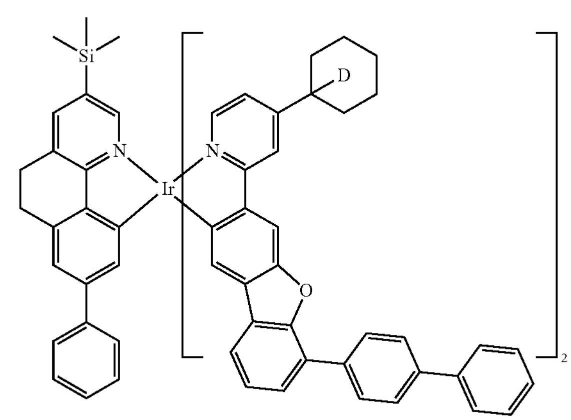
4855
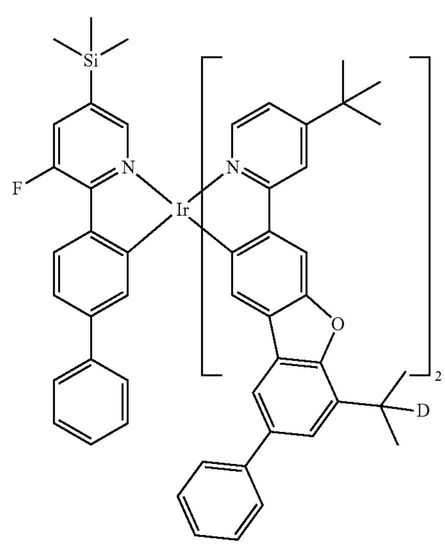

-continued
4856
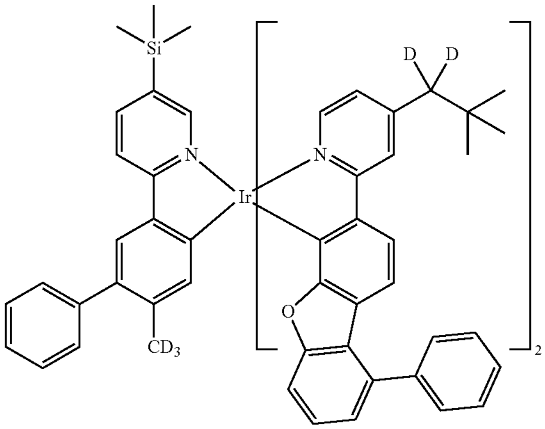
4857
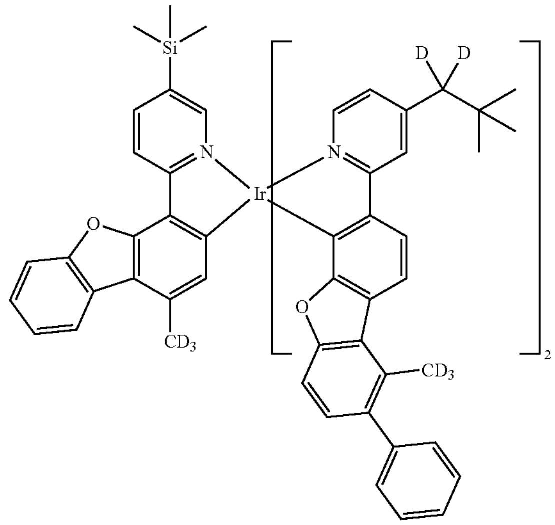
4858
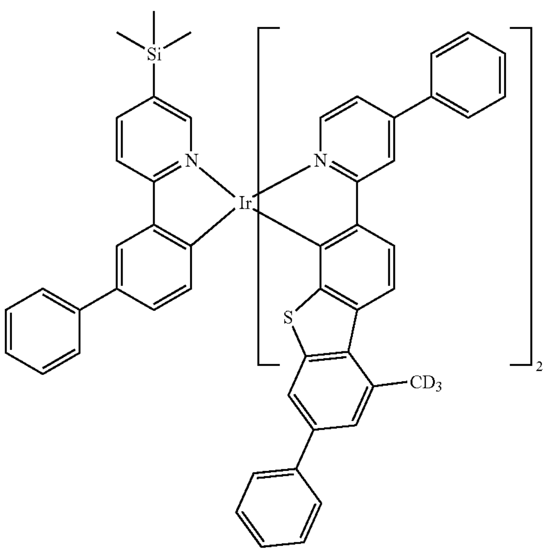
4859
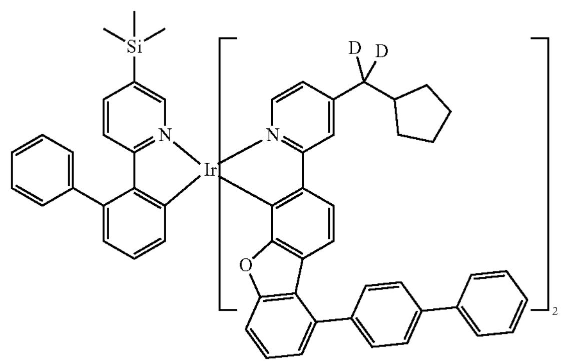
4860
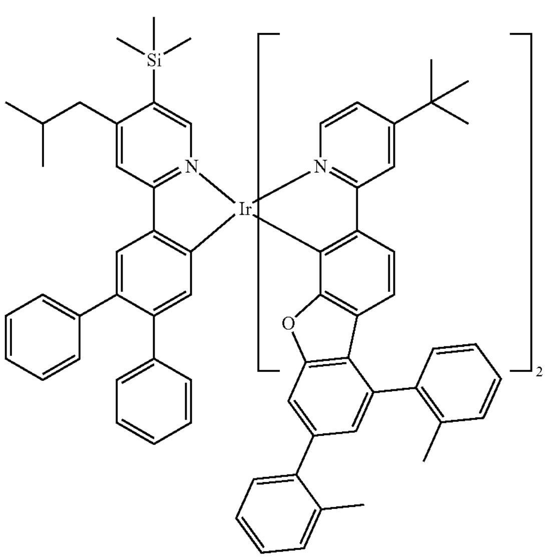
4861
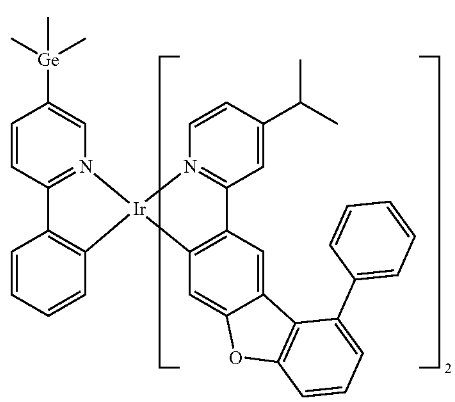

-continued
4862
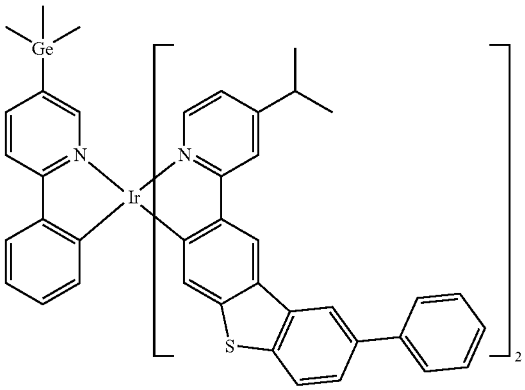
4863
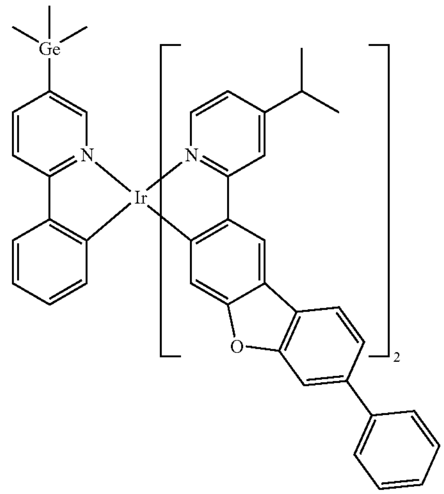
4864
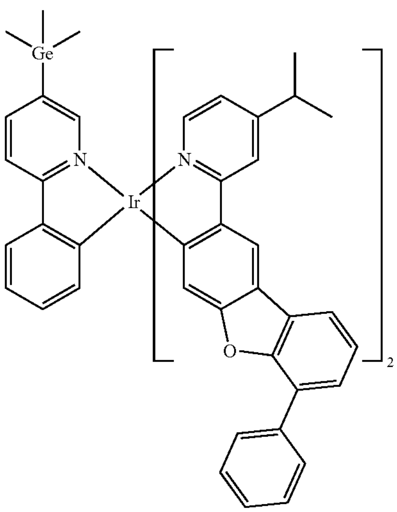
4865
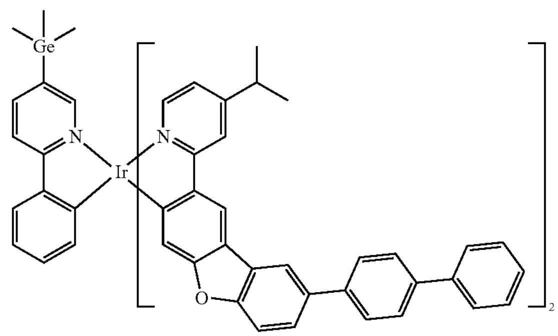
4866
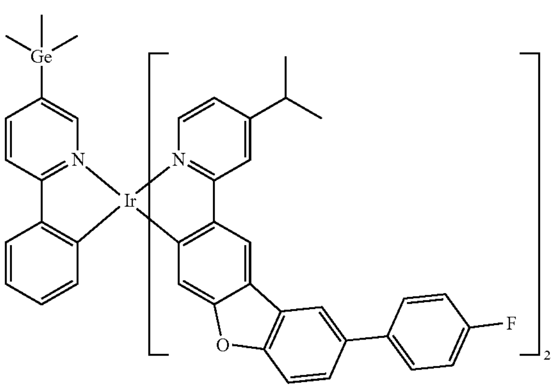
4867
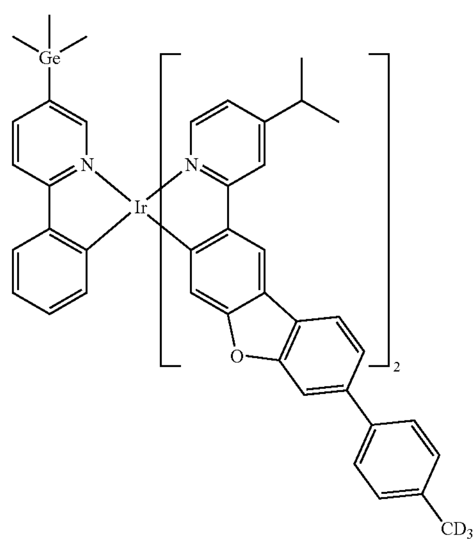

-continued
4868
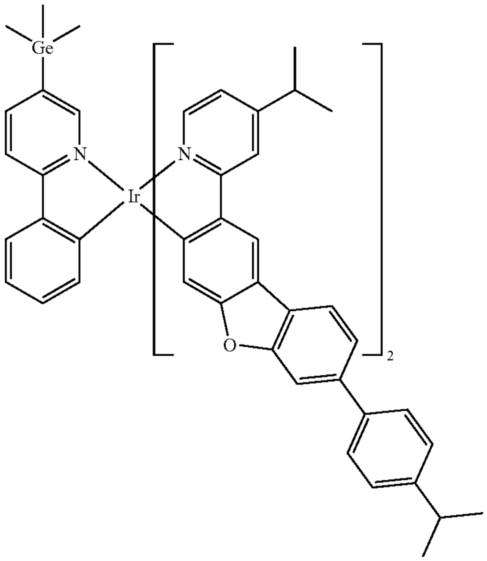
4869
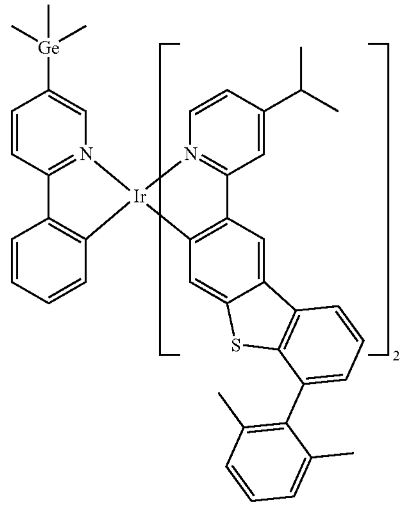
4870
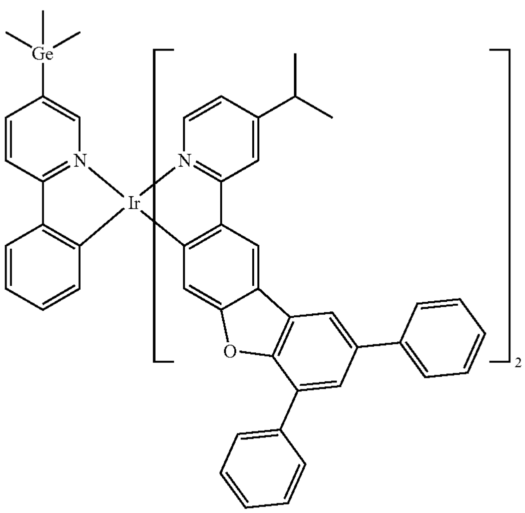
4871
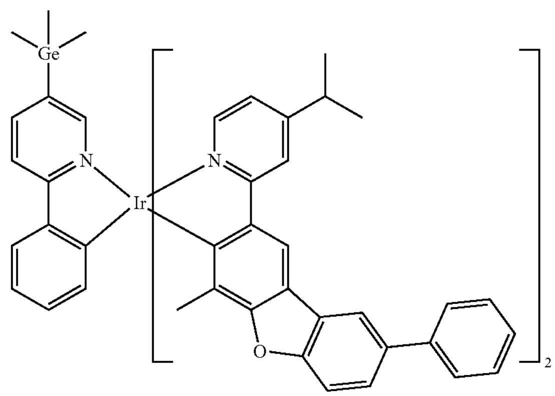
4872
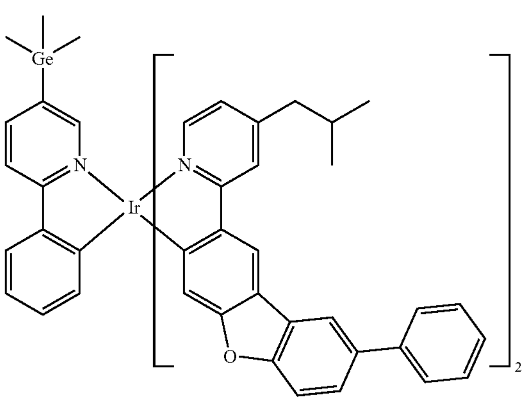
4873
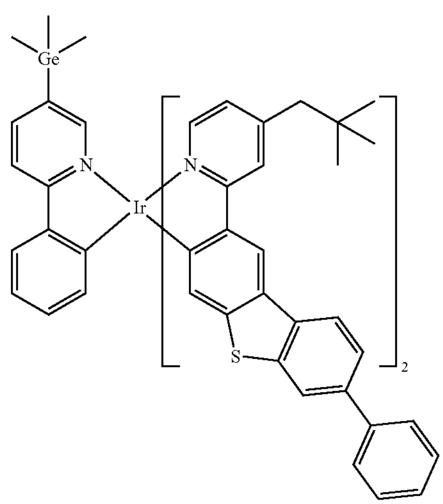

-continued
4874
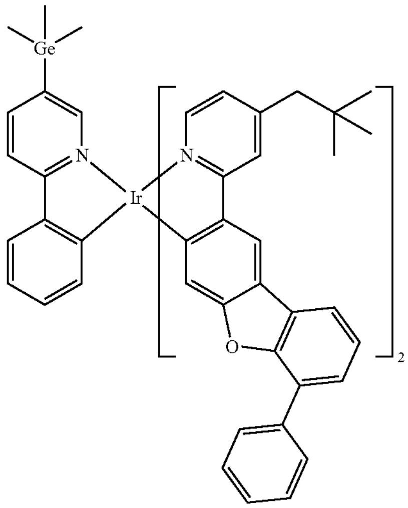
4875
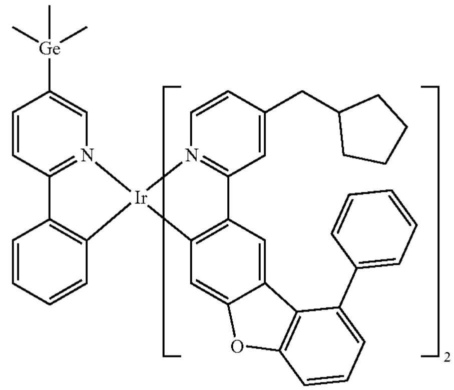
4876
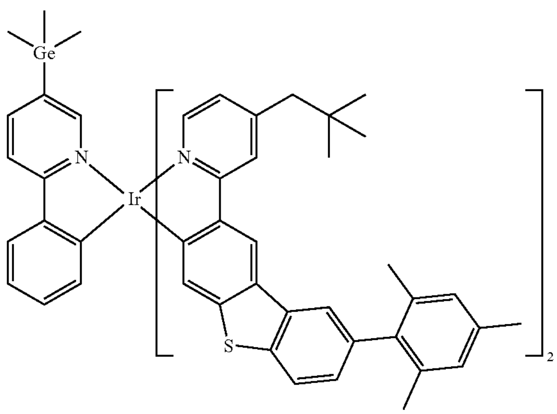
4877
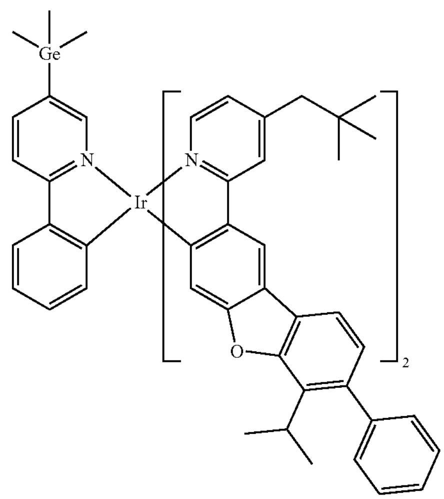
4878
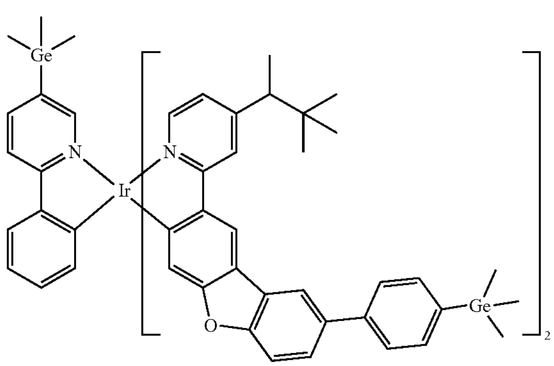
4879
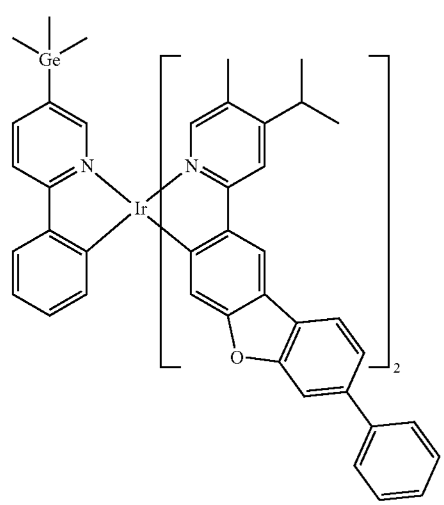

-continued
4880
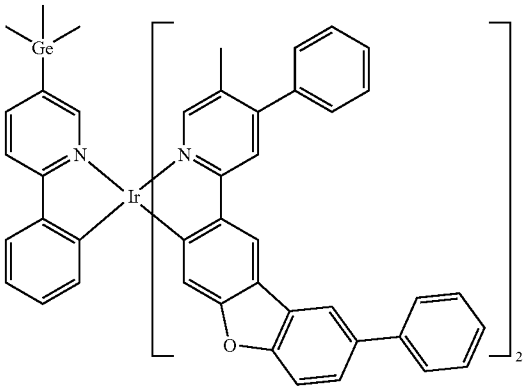
4881
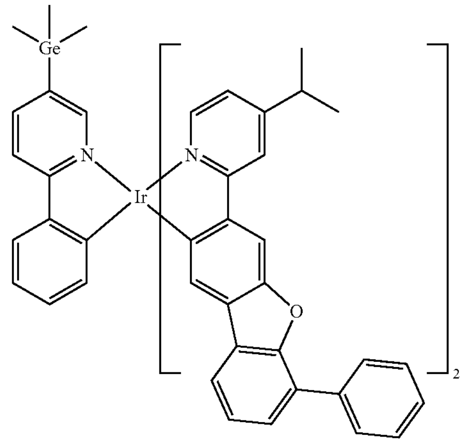
4882
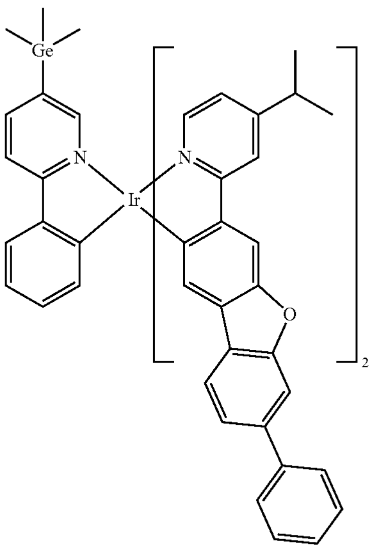
4883
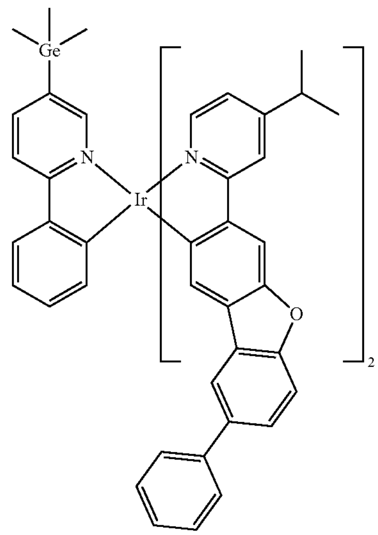
4884
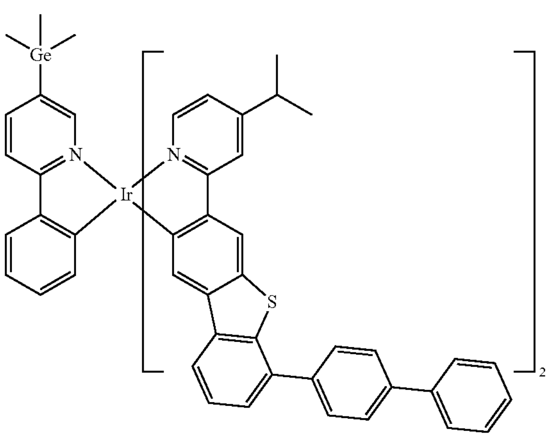
4885
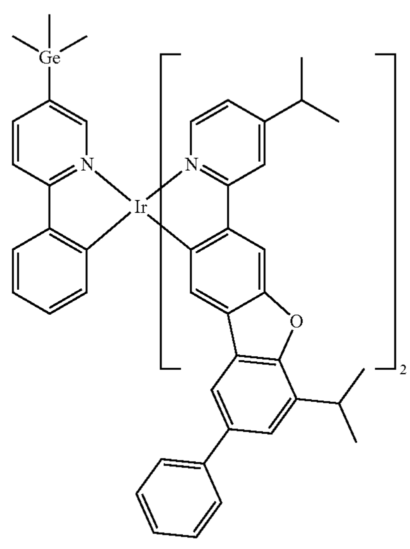

-continued
4886
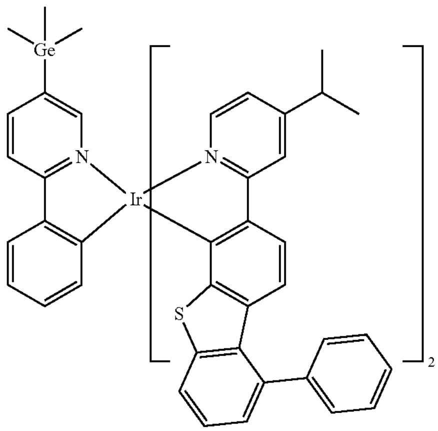
4887
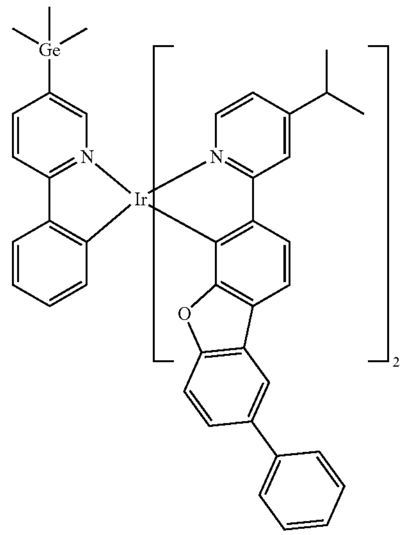
4888
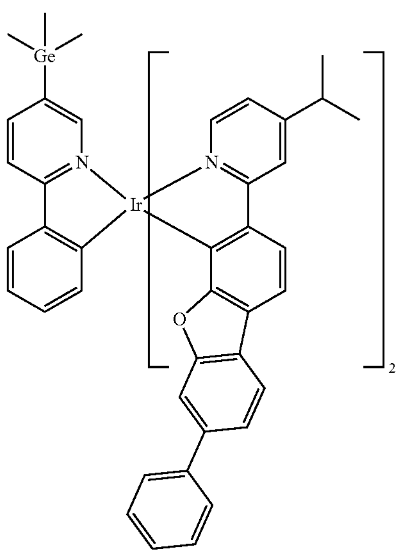
4889
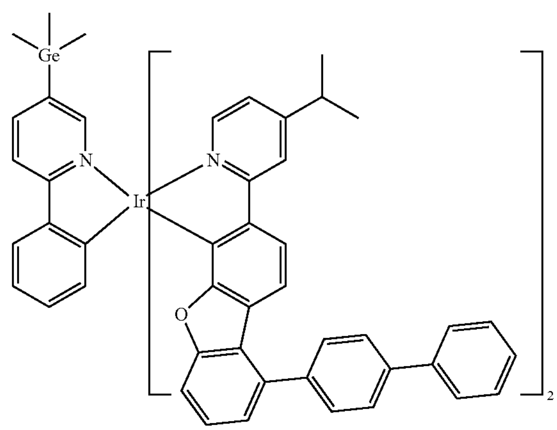
4890
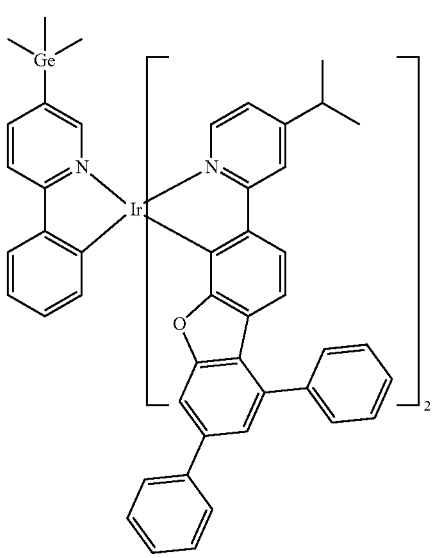
4891
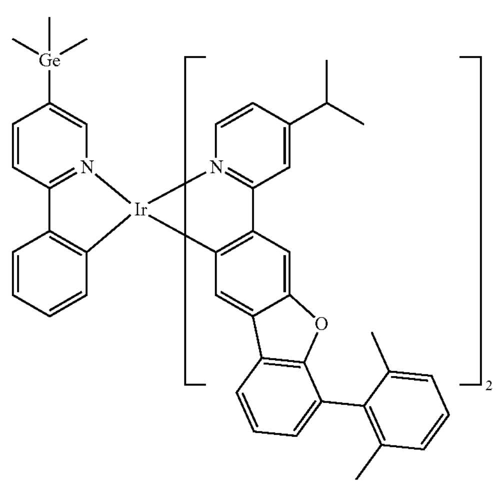

-continued
4892
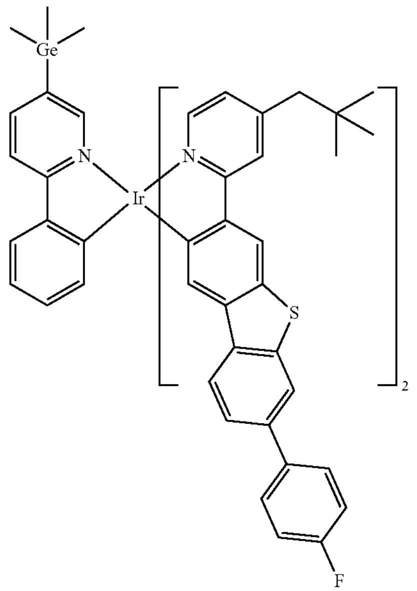
4893
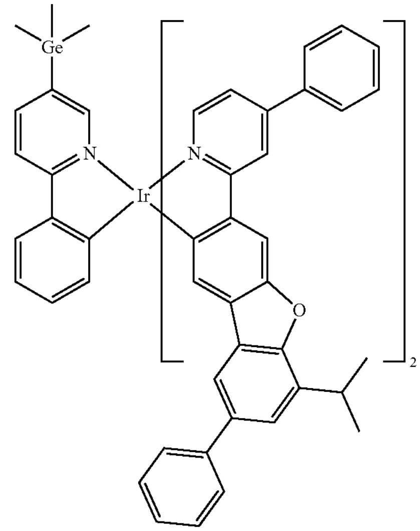
4894
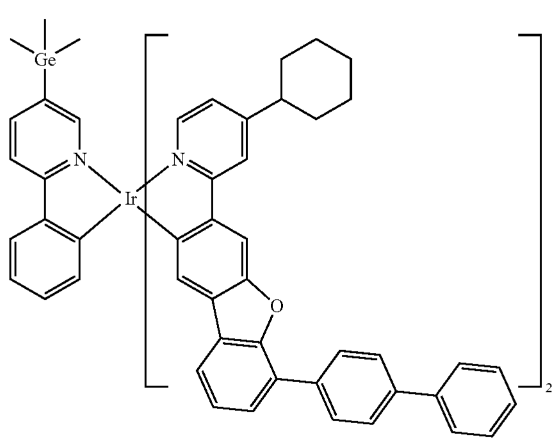
4895
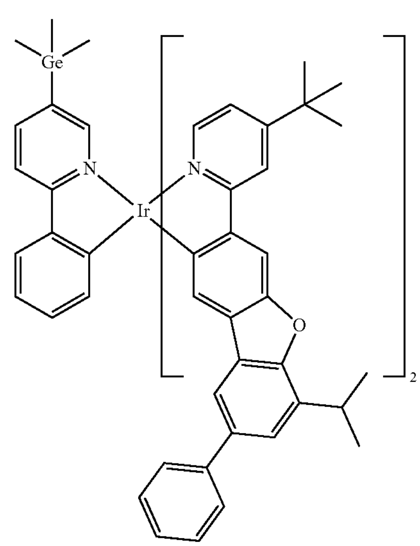

-continued
4896
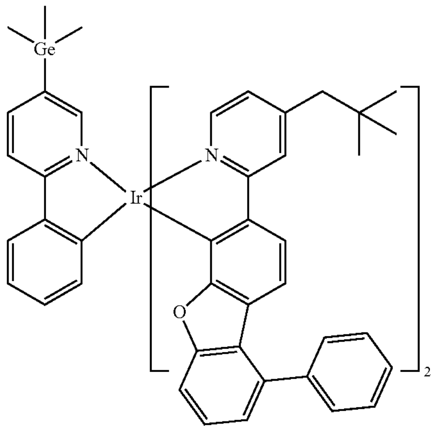
4897
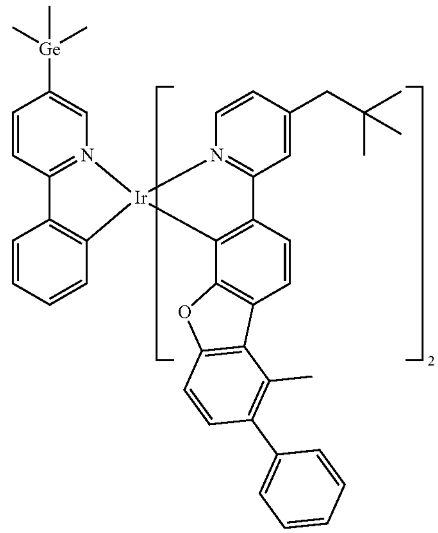
4898
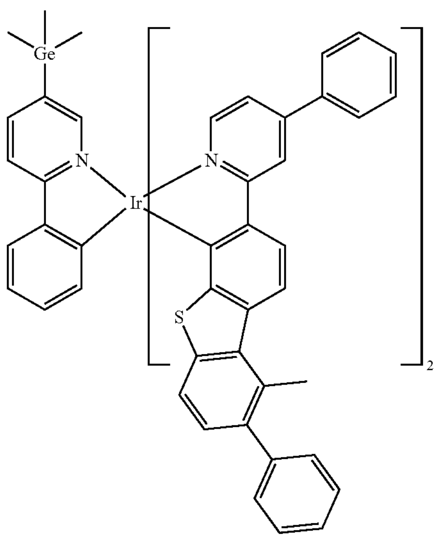
4899
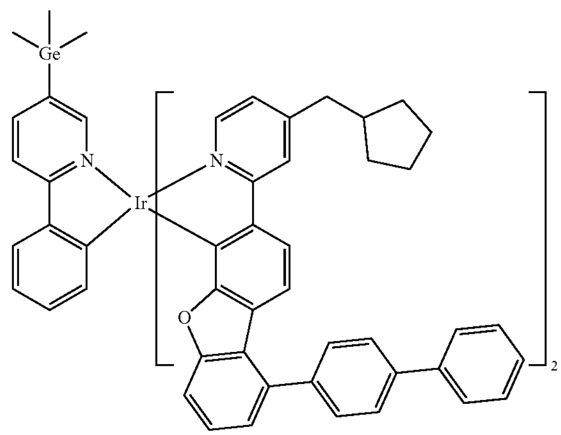
4900
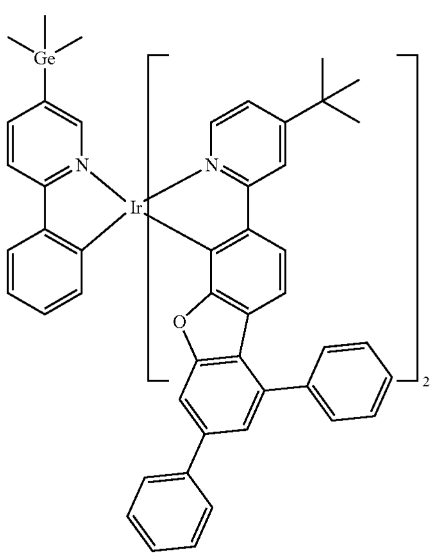
4901
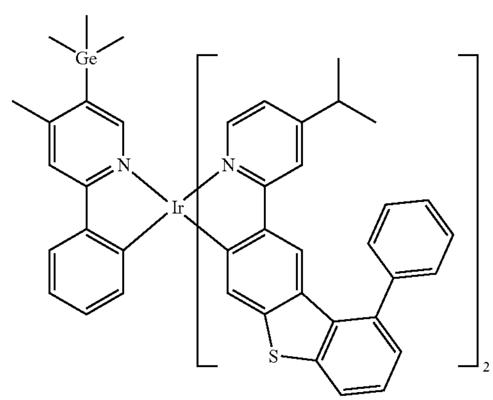

-continued
4902
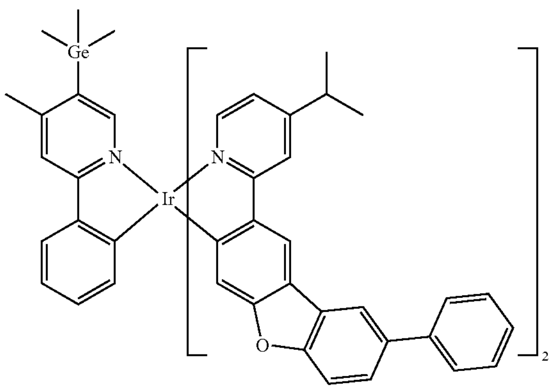
4903
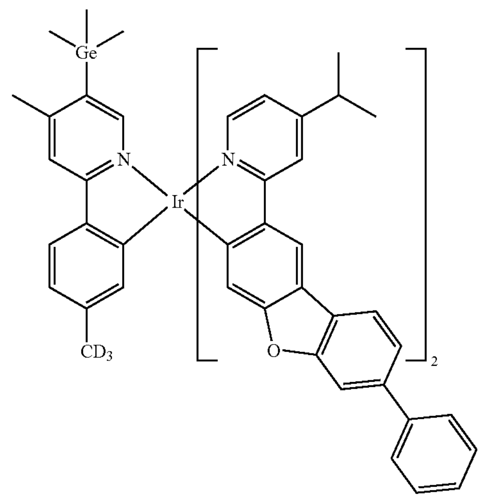
4904
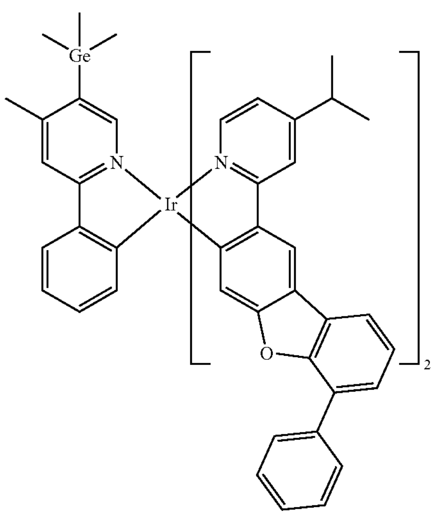
4905
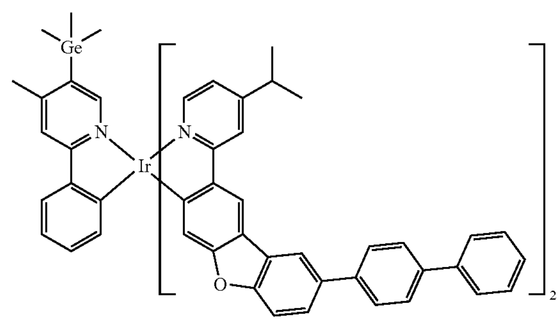
4906
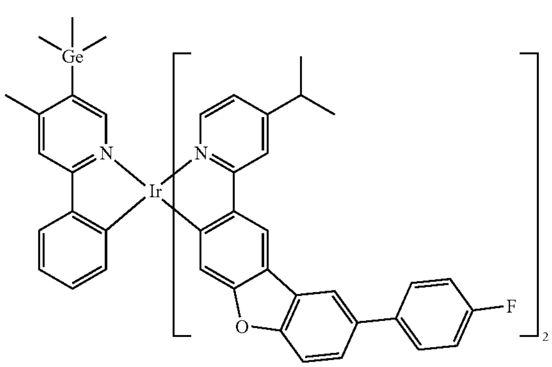
4907
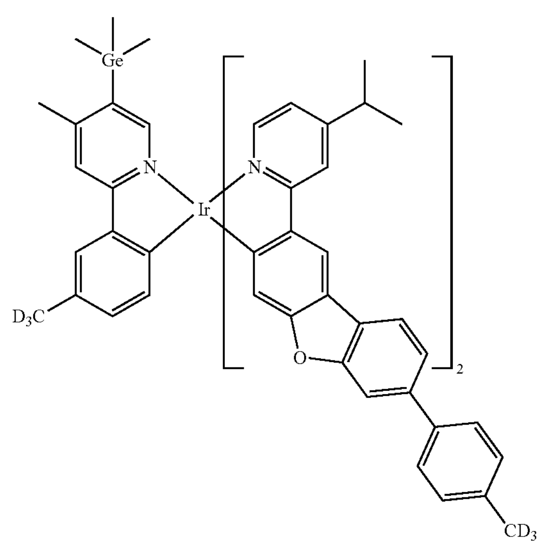

-continued
4908
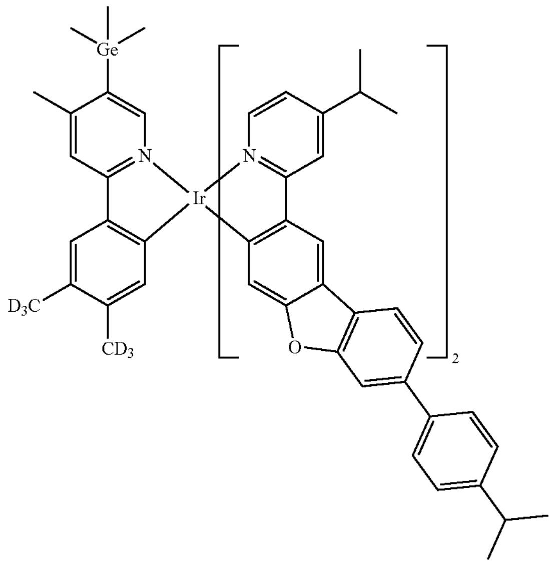
4909
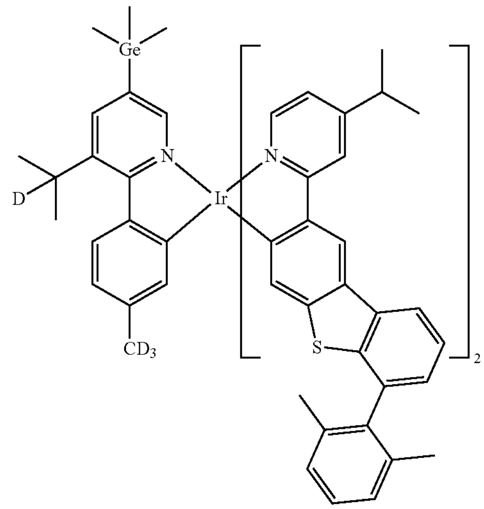
4910
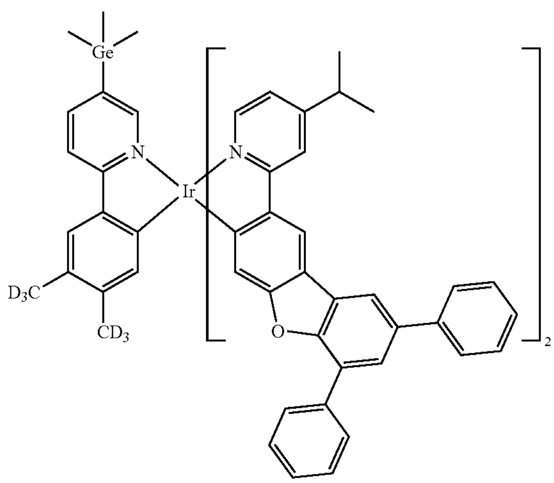
4911
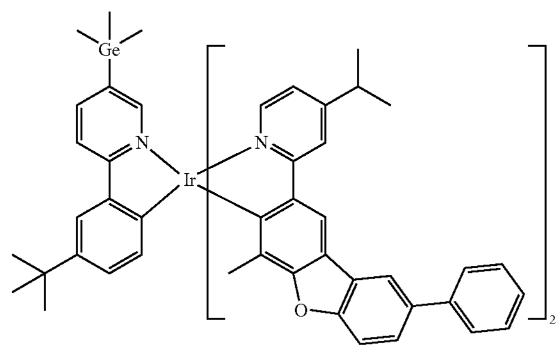
4912
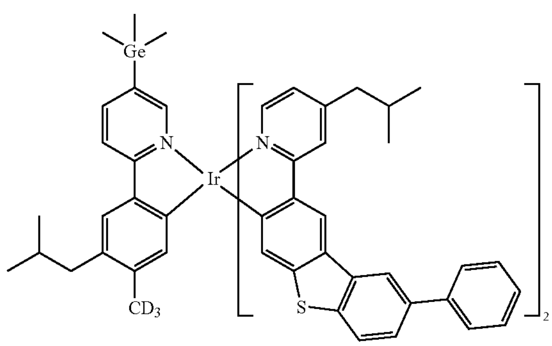
4913
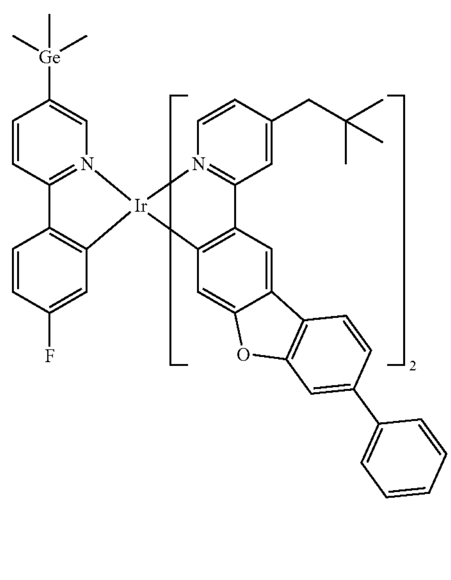

-continued
4914
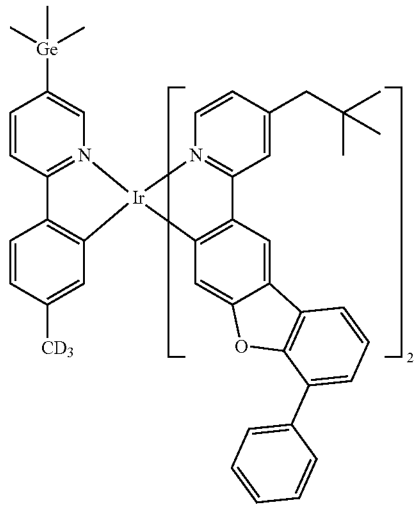
4915
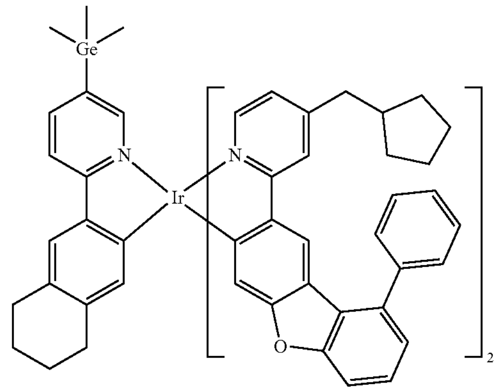
4916
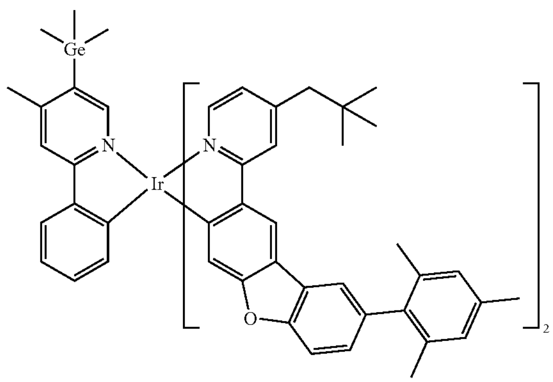
4917
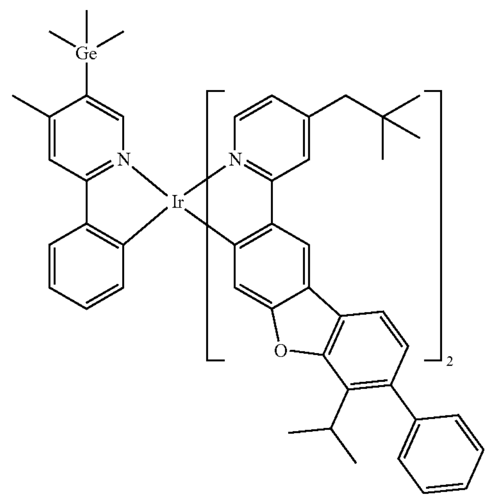
4918
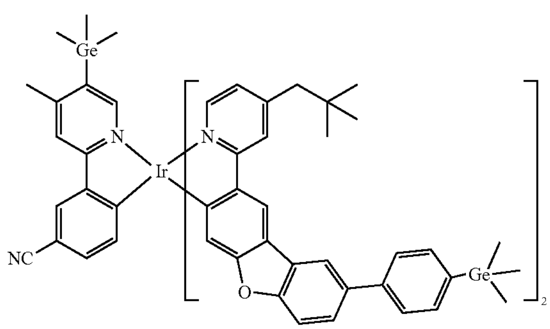
4919
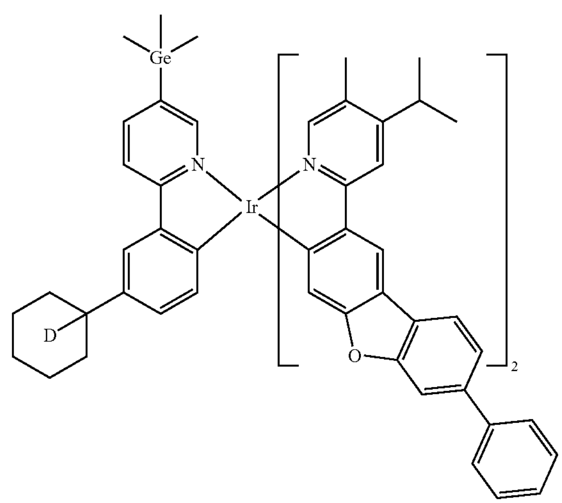

-continued
4920
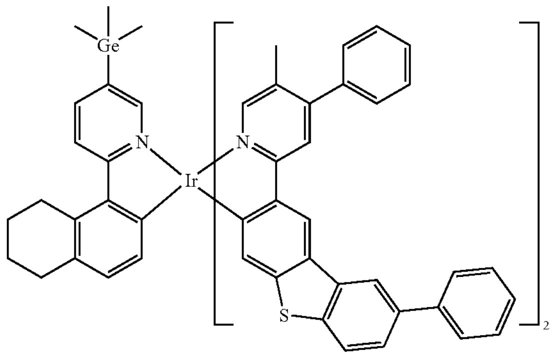
4921
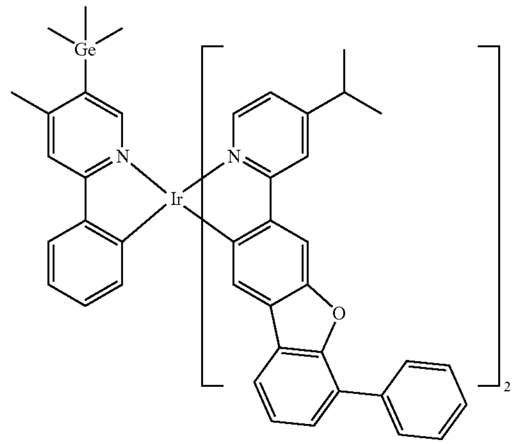
4922
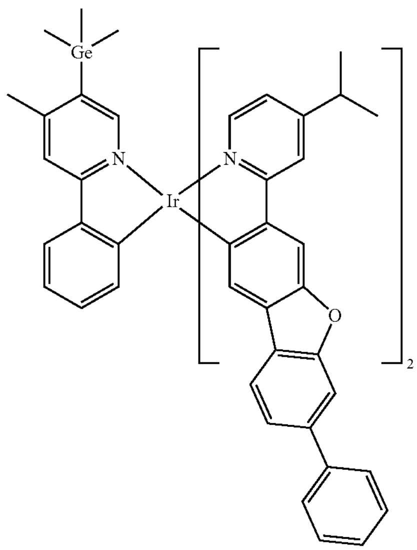
4923
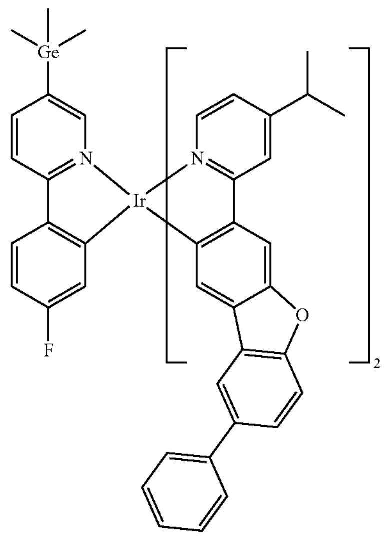
4924
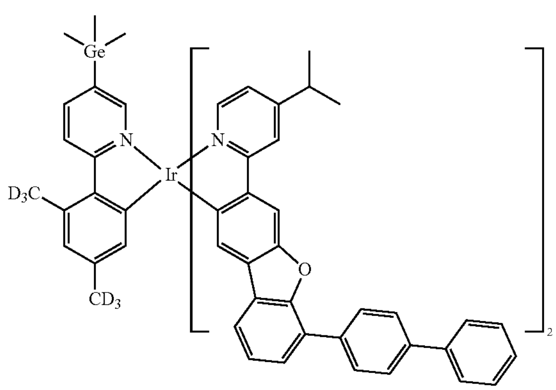
4925
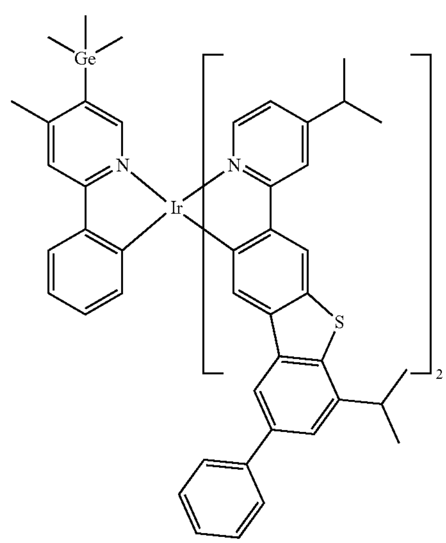

-continued
4926
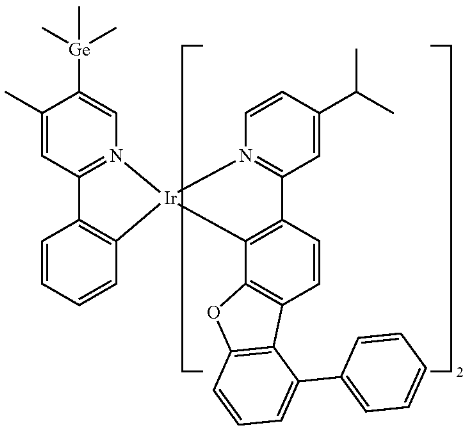
4927
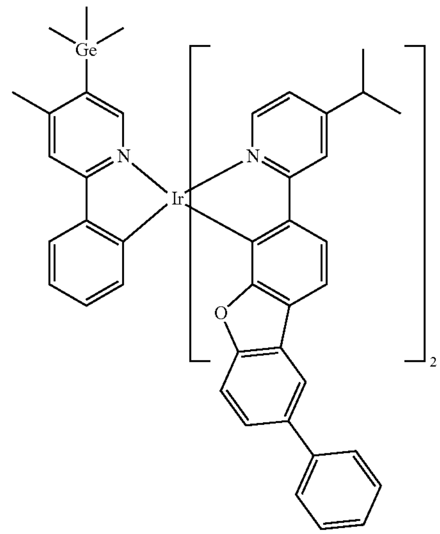
4928
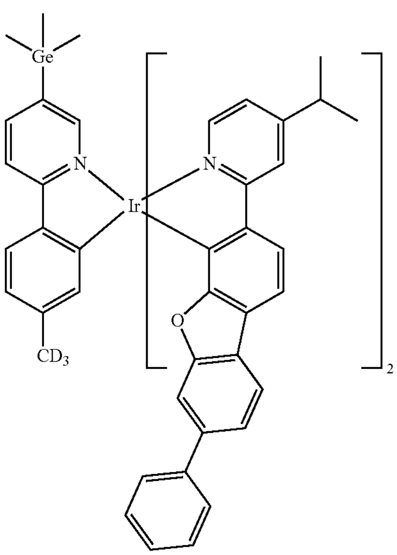
4929
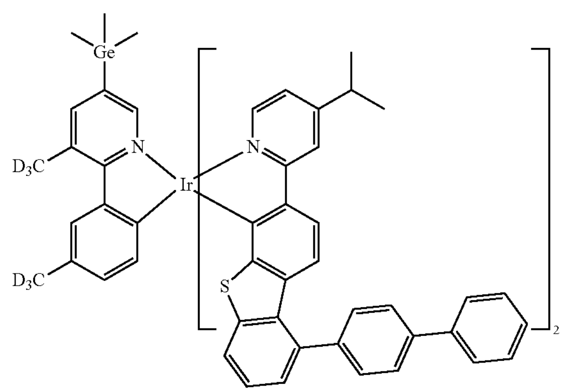
4930
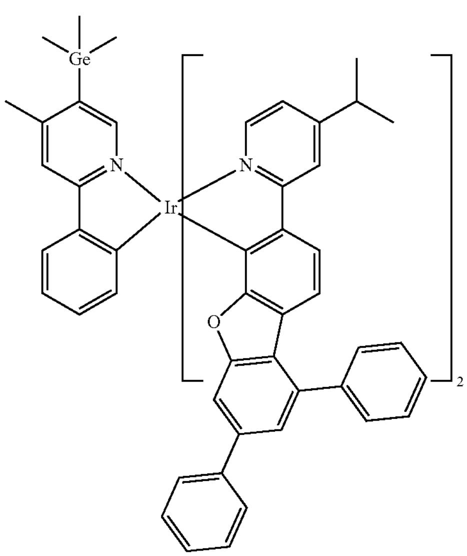
4931
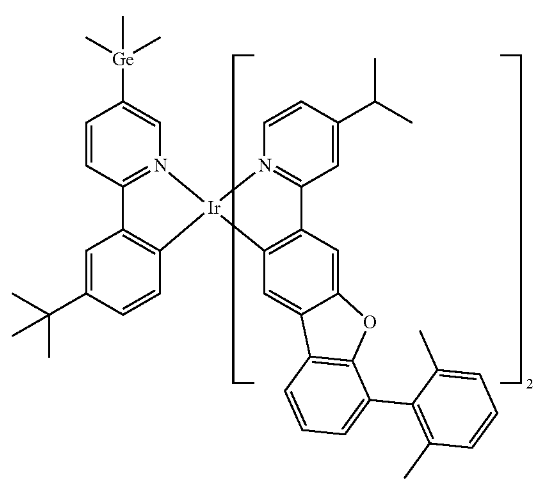

-continued
4932
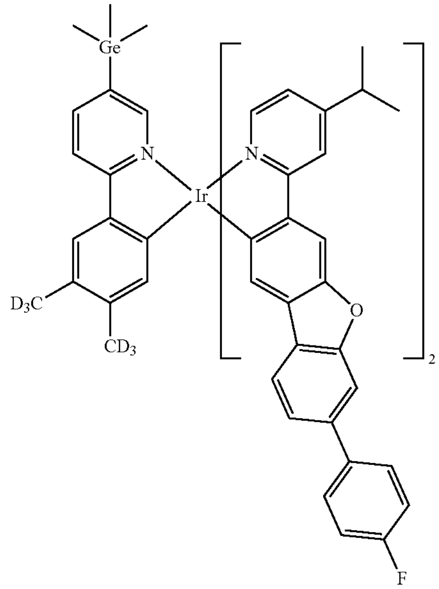
4933
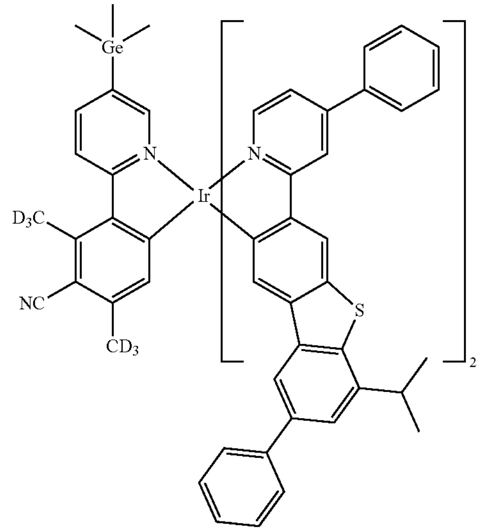
4934
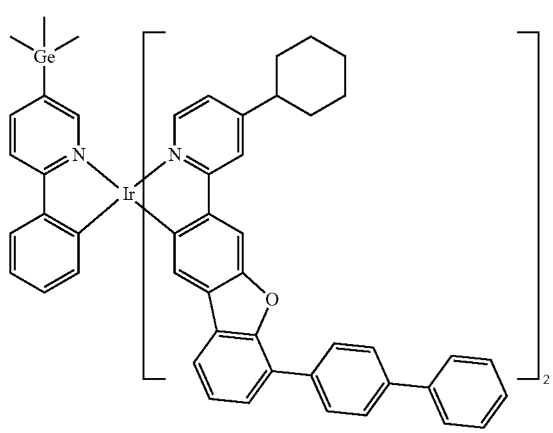
4935
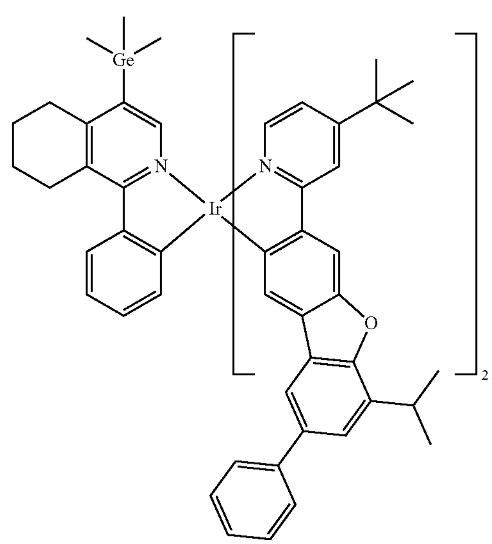

-continued
4936
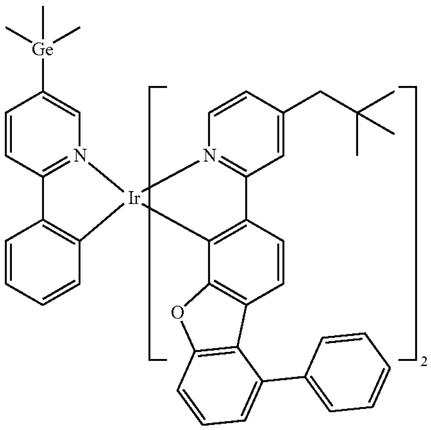
4937
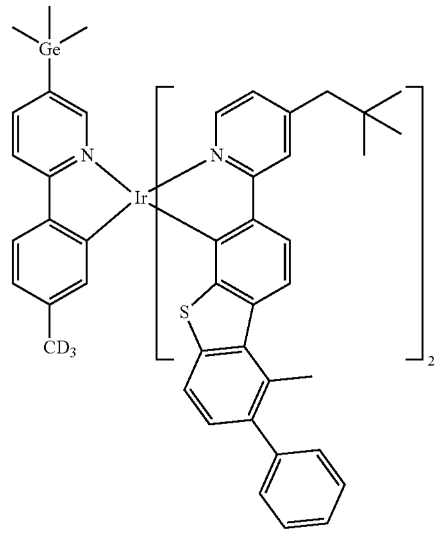
4938
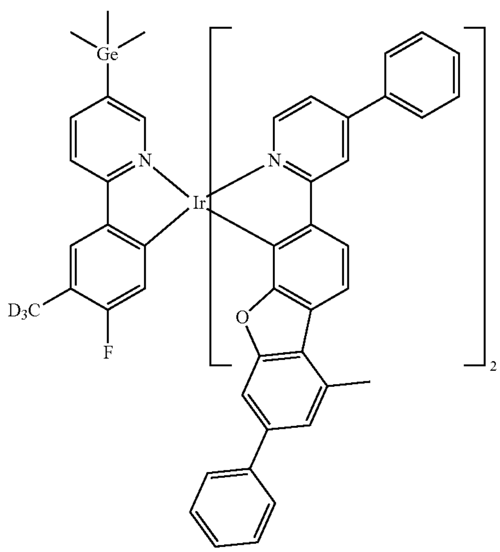
4939
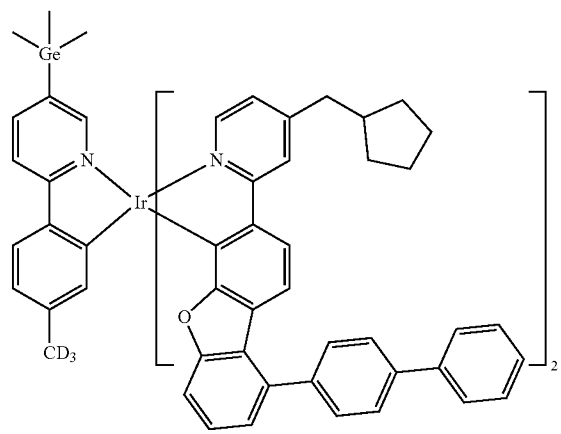
4940
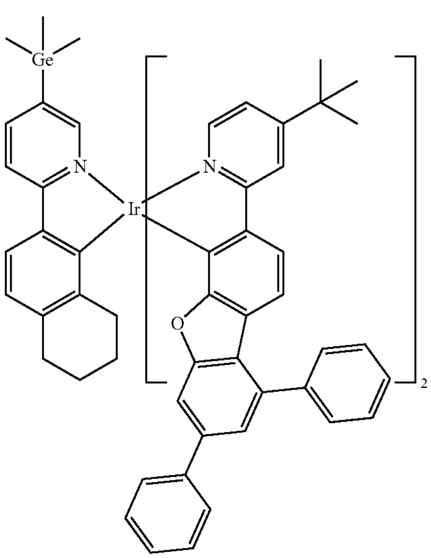
4941
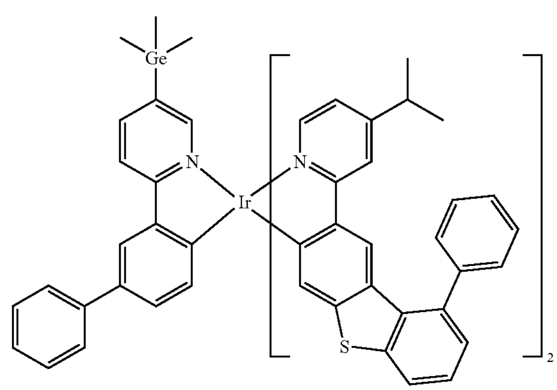

-continued
4942
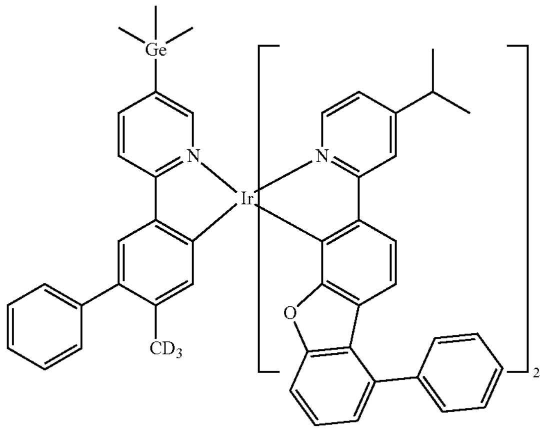
4943
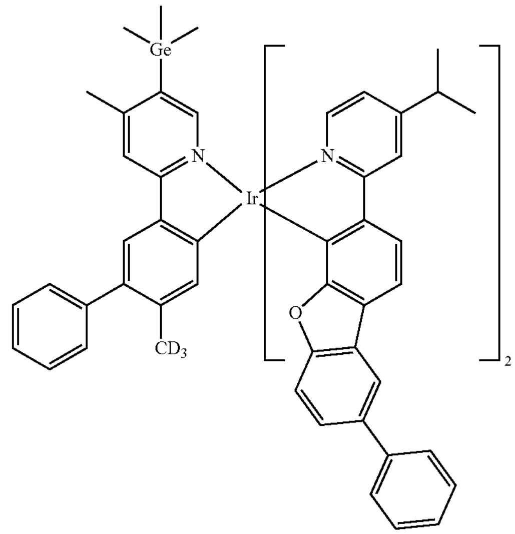
4944
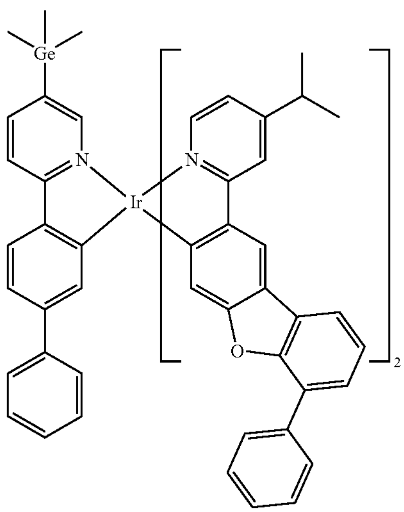
4945
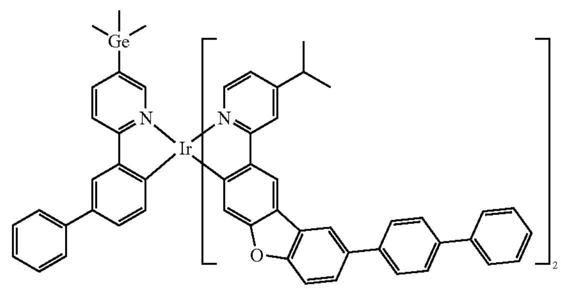
4946
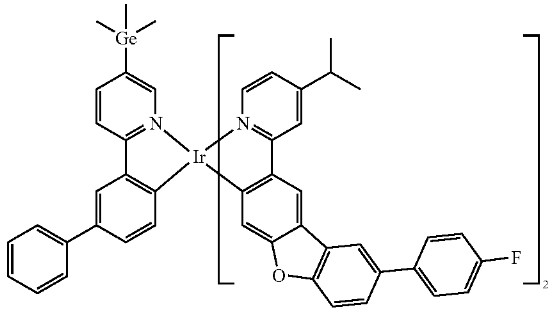
4947
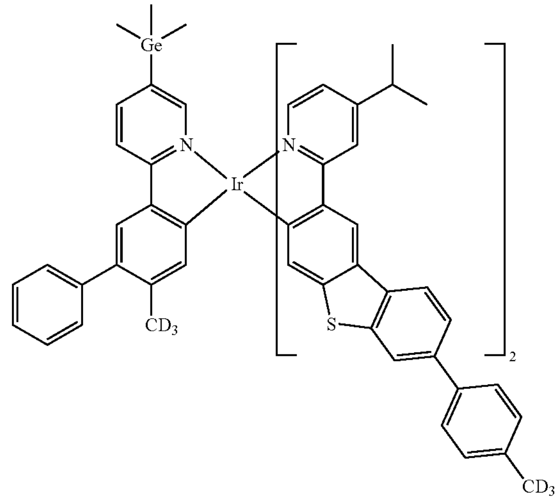

-continued
4948
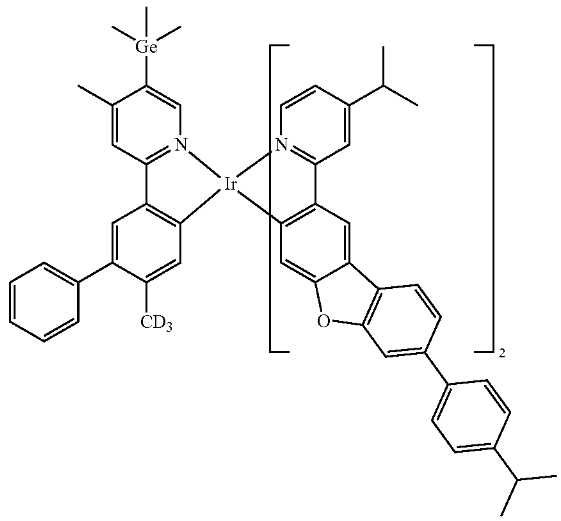
4949
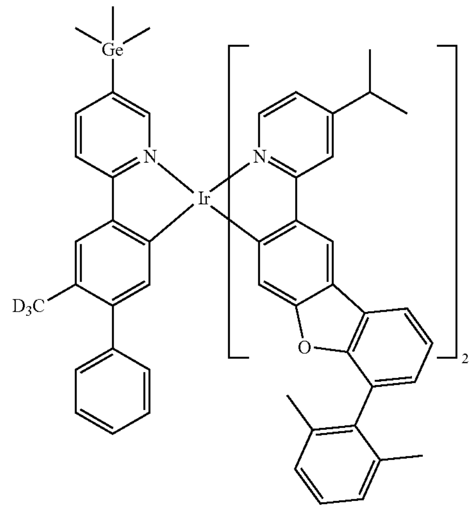
4950
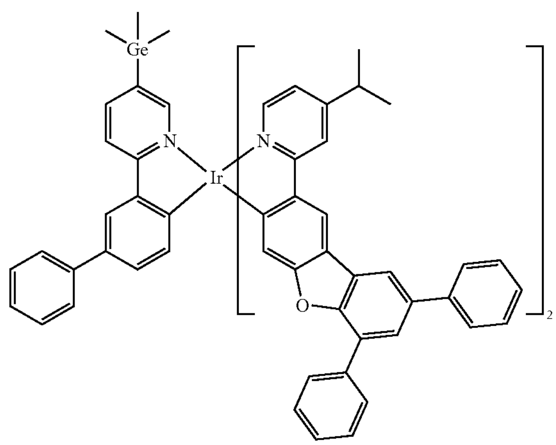
4951
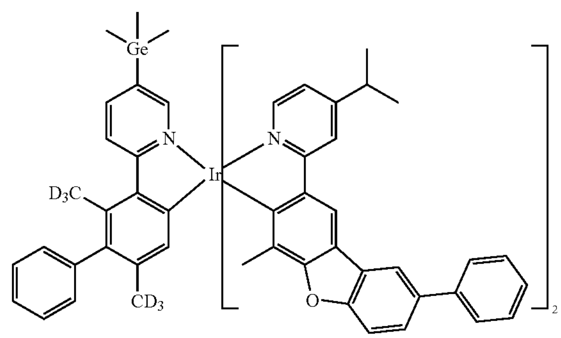
4952
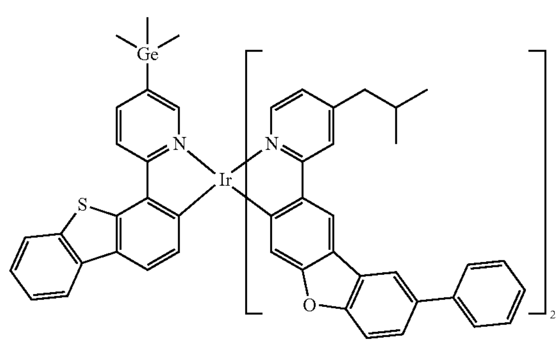
4953
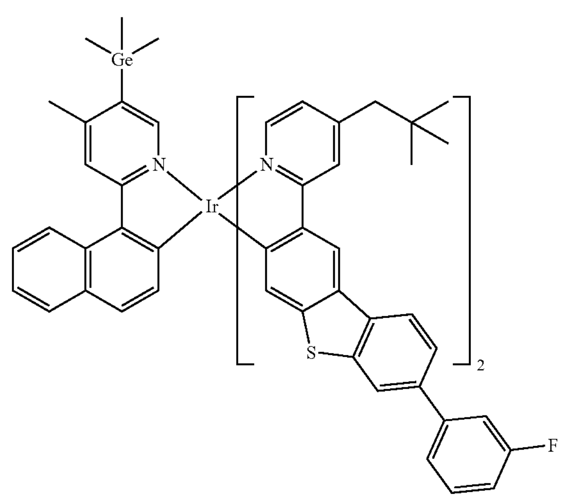

-continued
4954
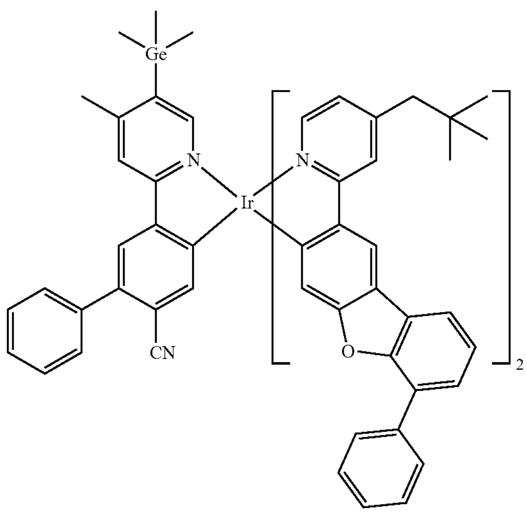
4955
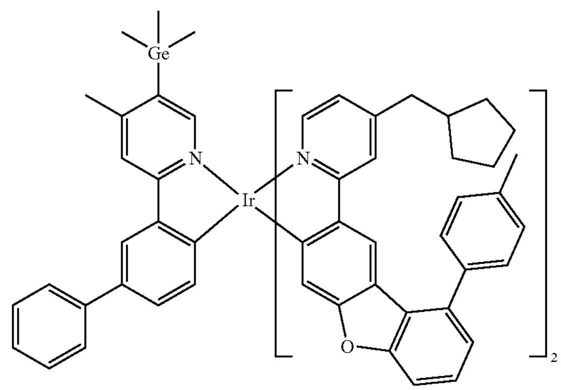
4956
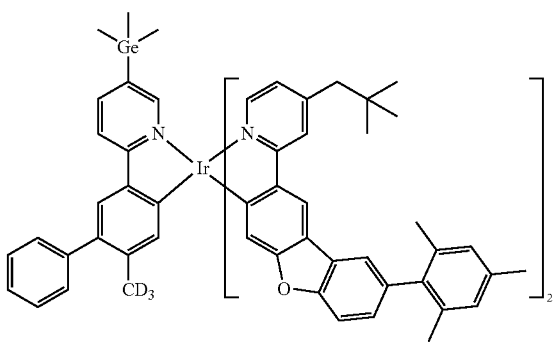
4957
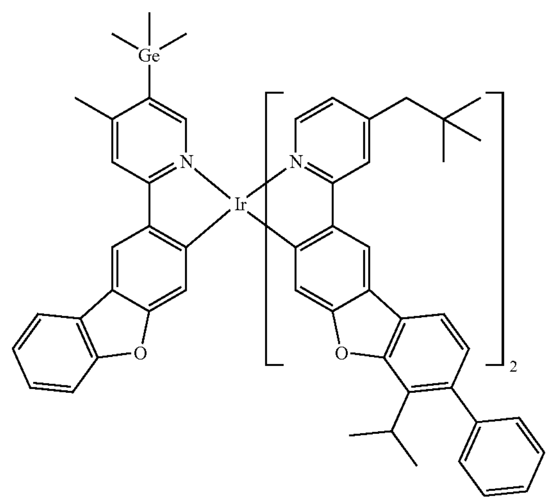
4958
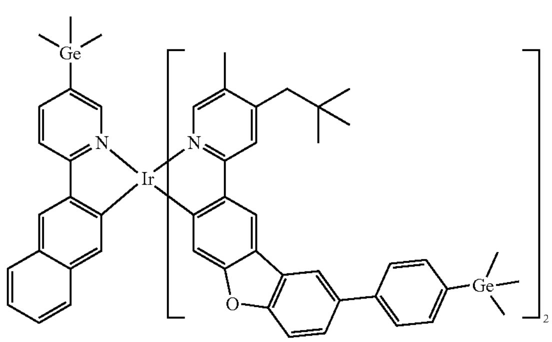
4959
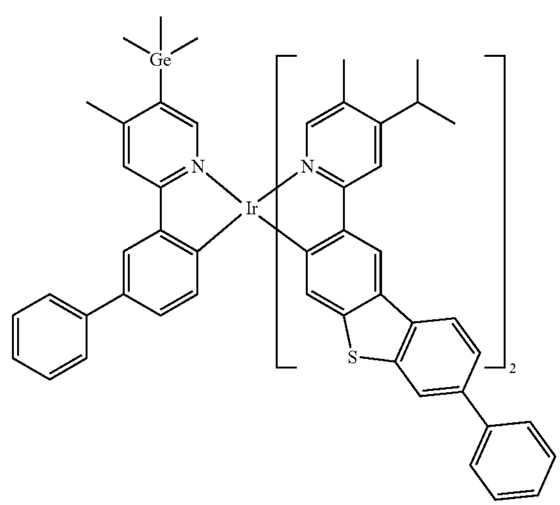

-continued
4960
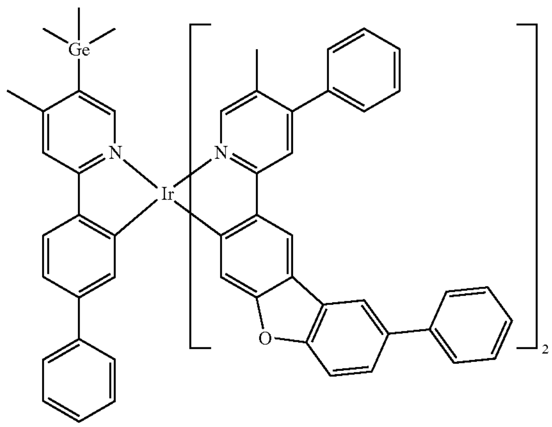
4961
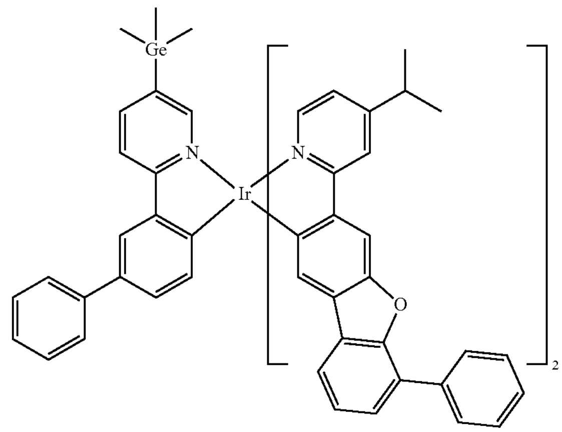
4962
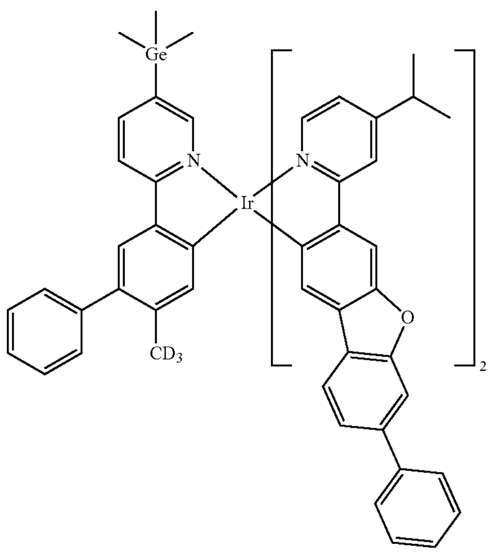
4963
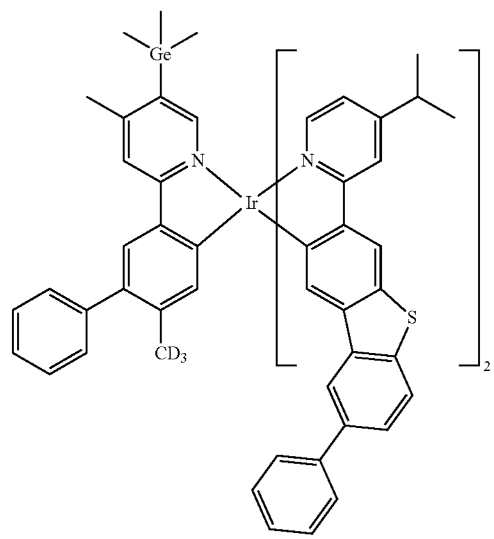
4964
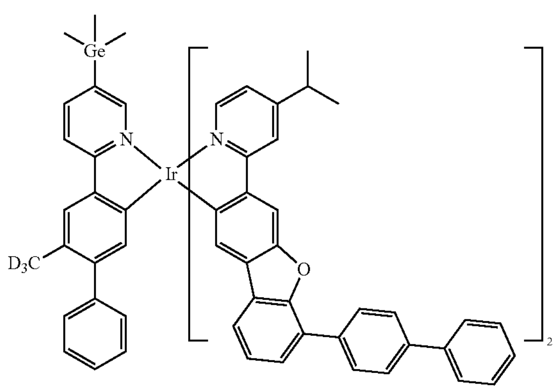
4965
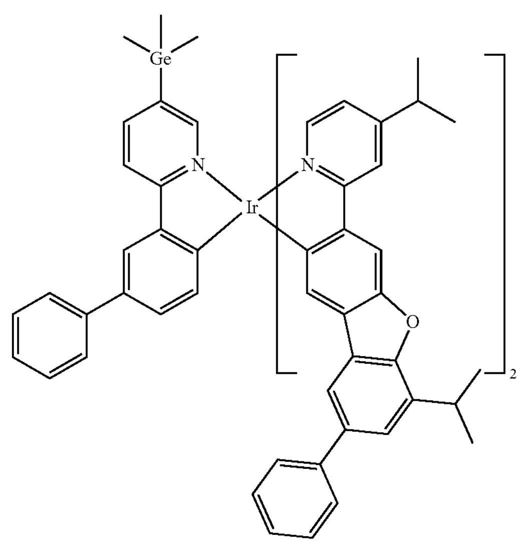

-continued
4966
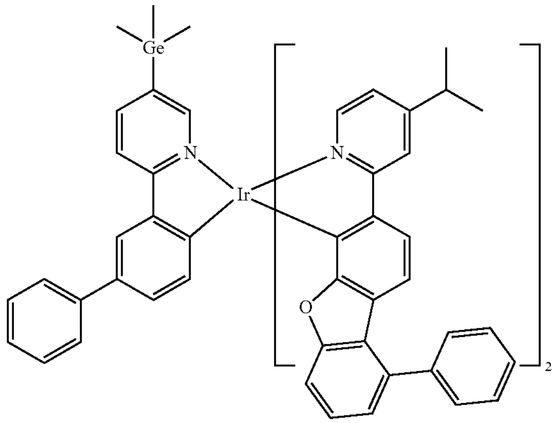
4967
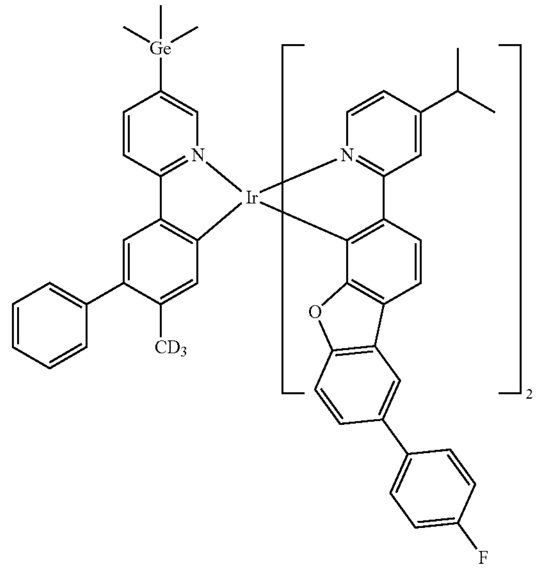
4968
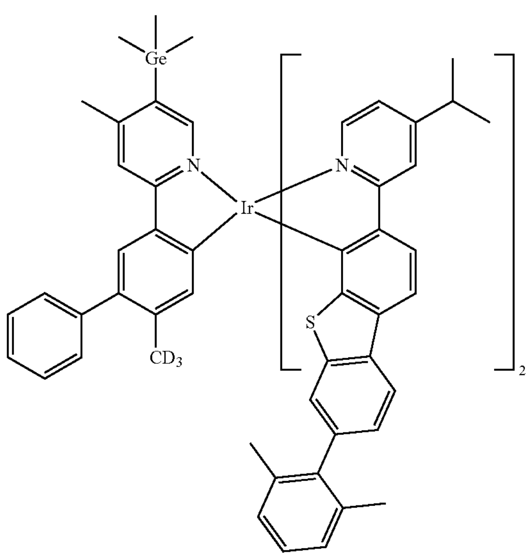
4969
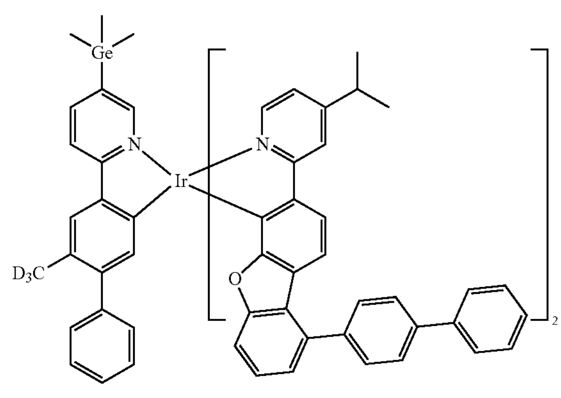

-continued
4970
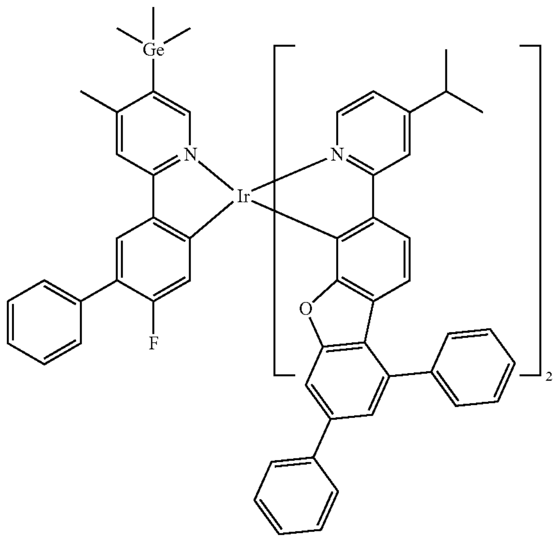
4971
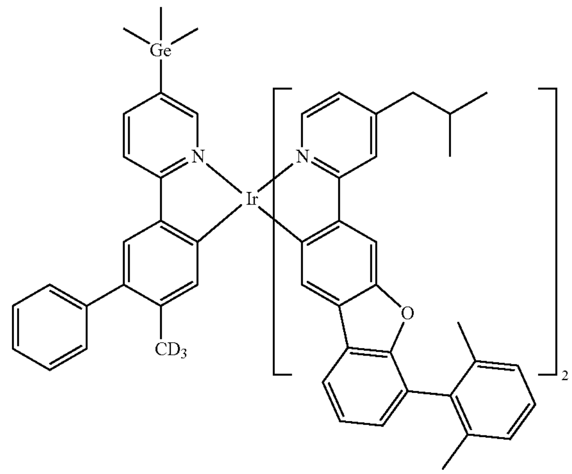
4972
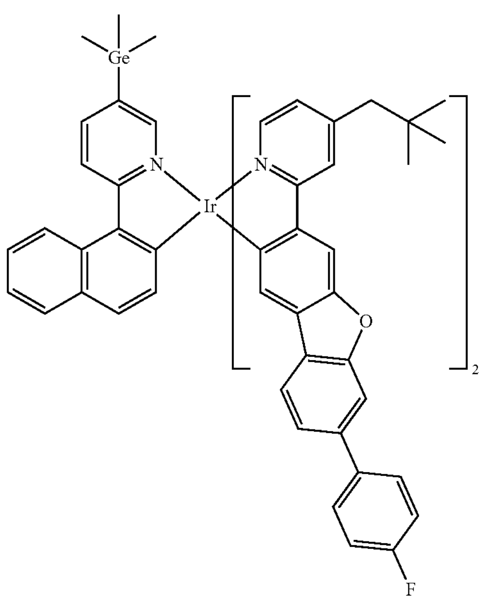
4973
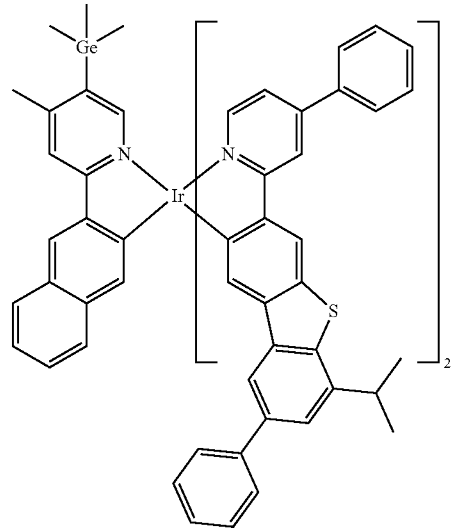

-continued
4974
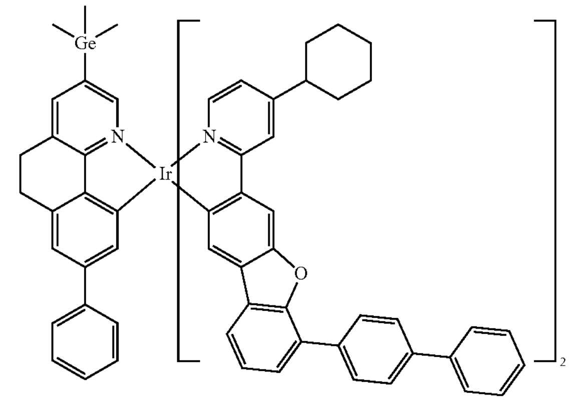
4975
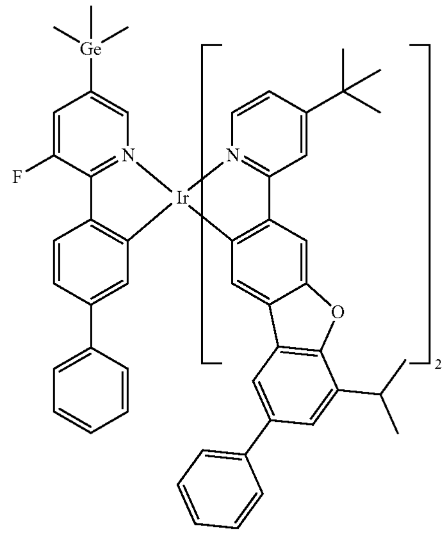
4976
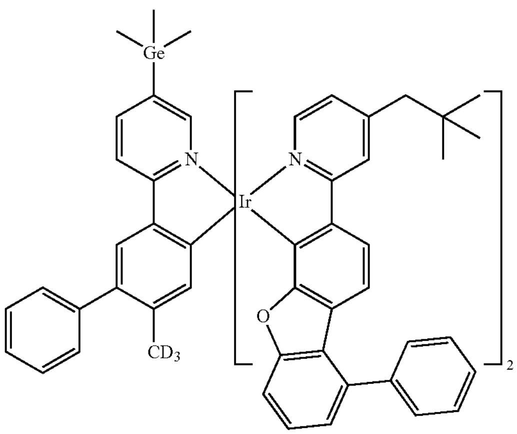
4977
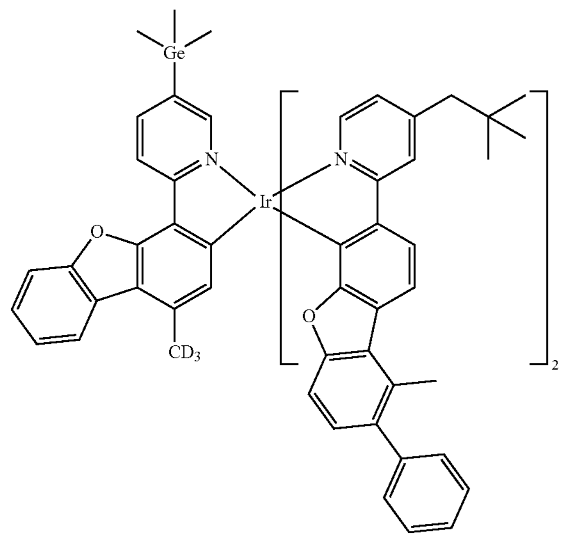
4978
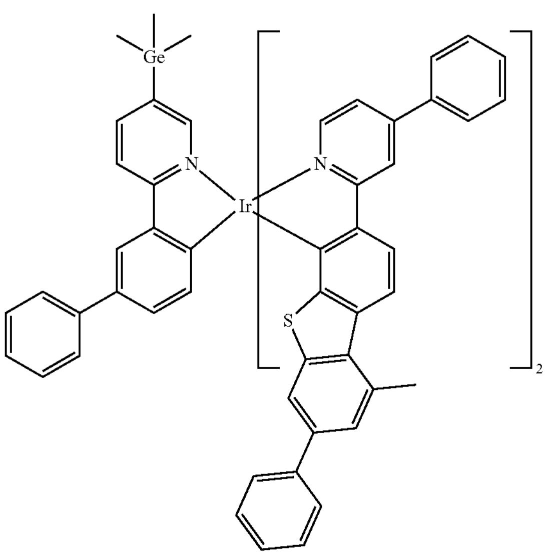
4979
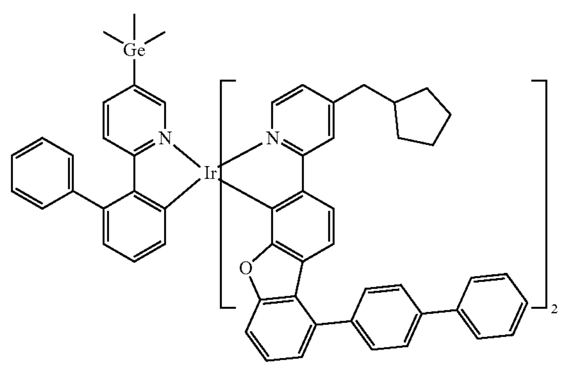

-continued
4980
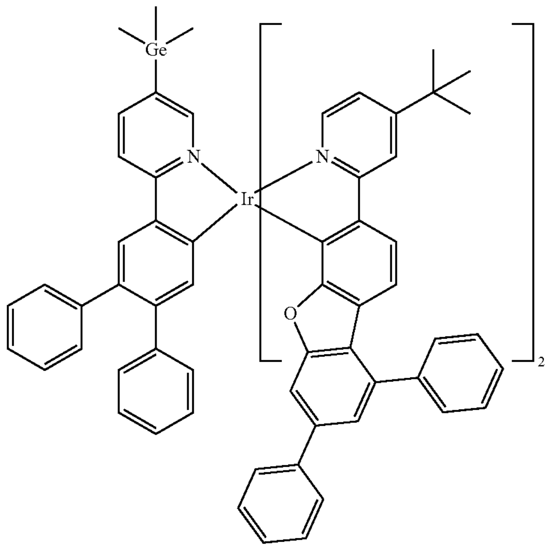
4981
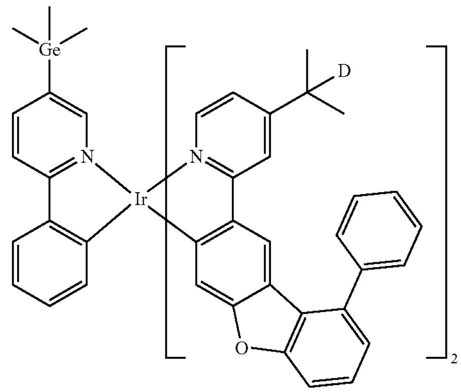
4982
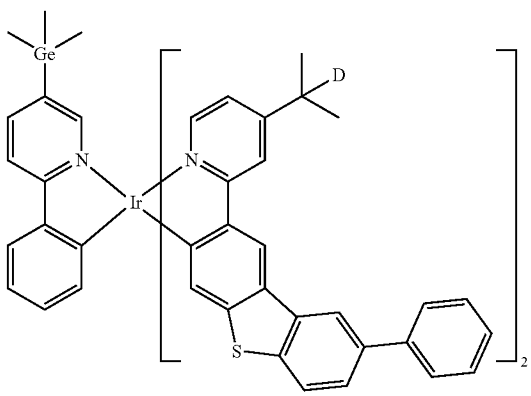
4983
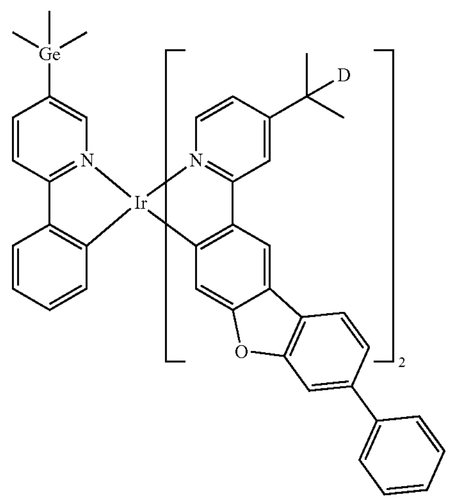
4984
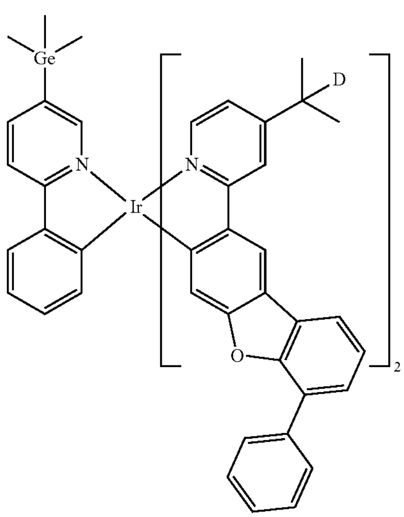
4985
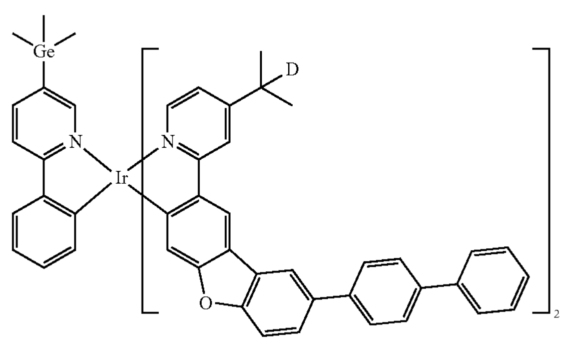

-continued
4986
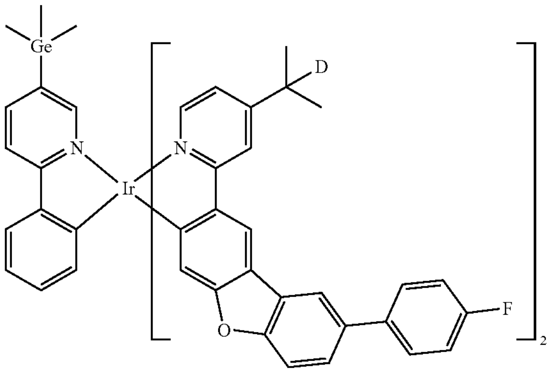
4987
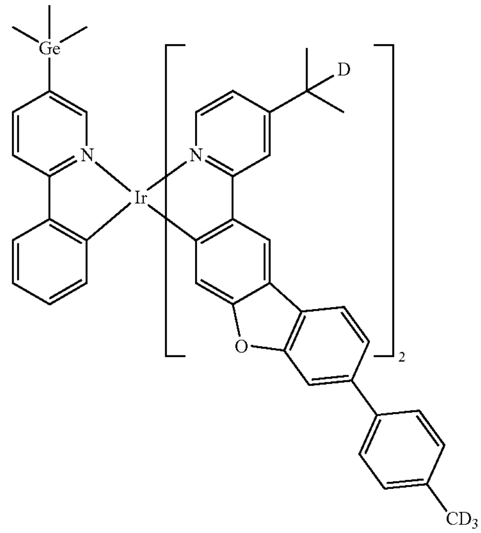
4988
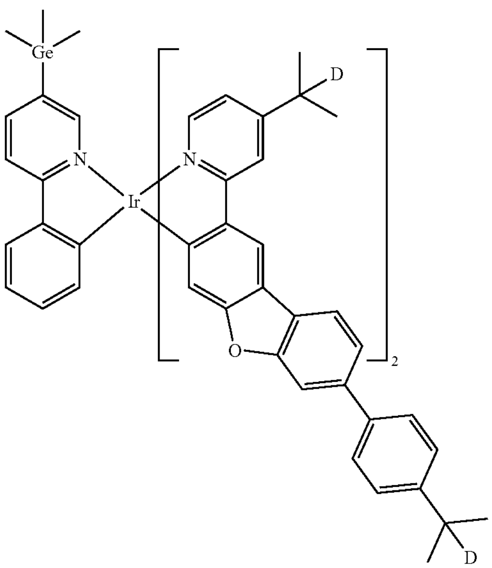
4989
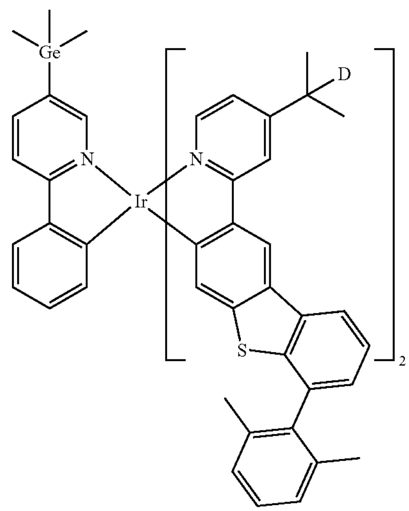
4990
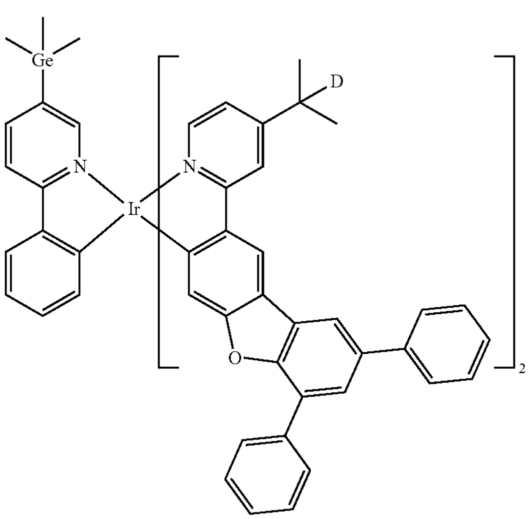
4991
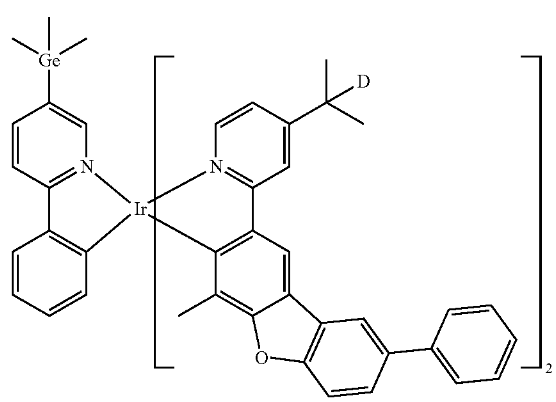

-continued
4992
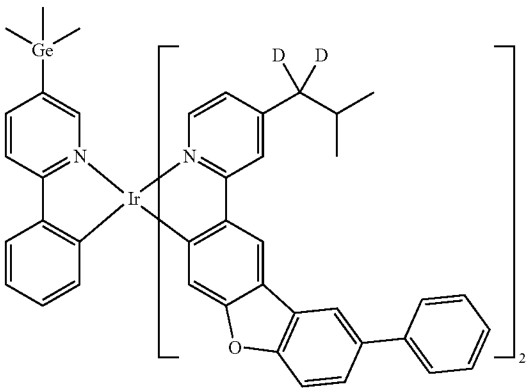
4993
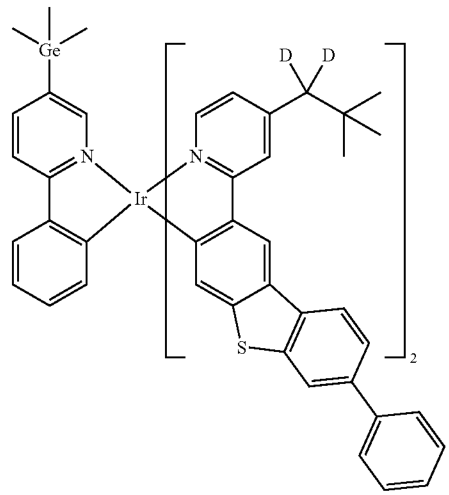
4994
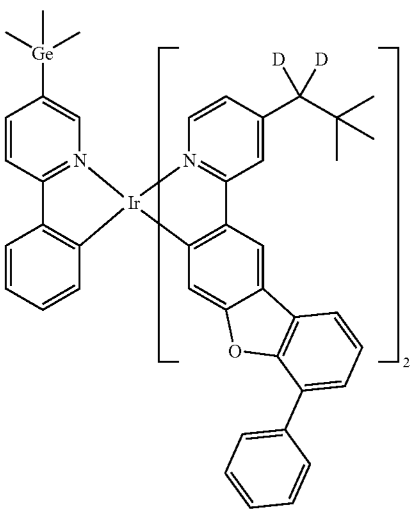
4995
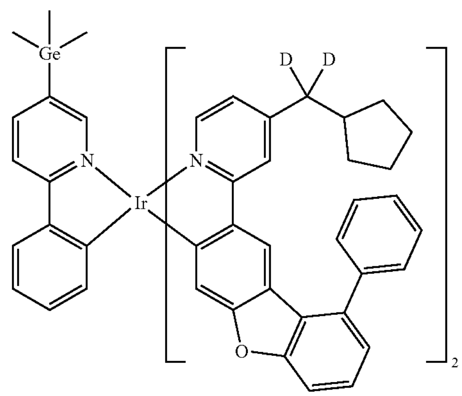
4996
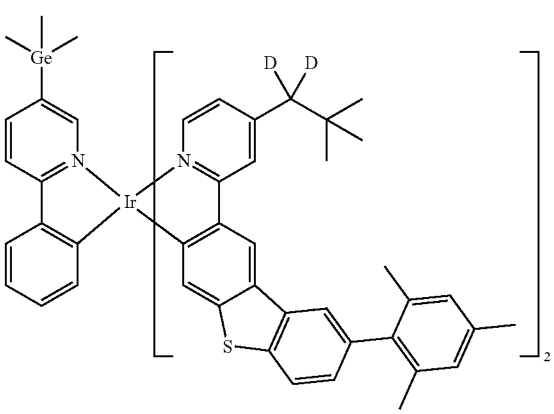
4997
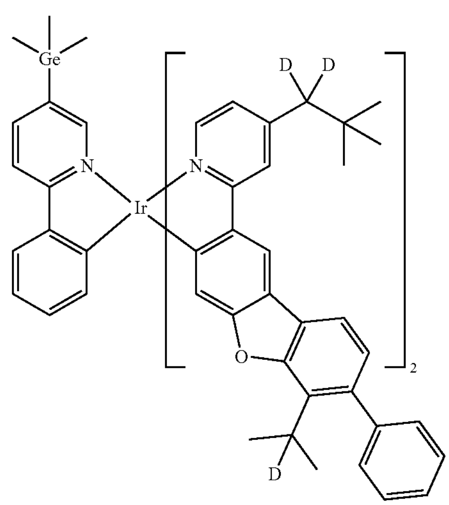

-continued
4998
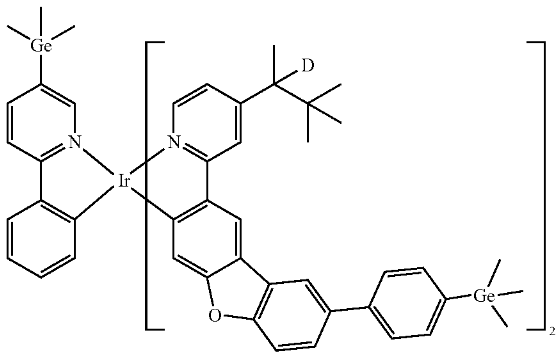
4999
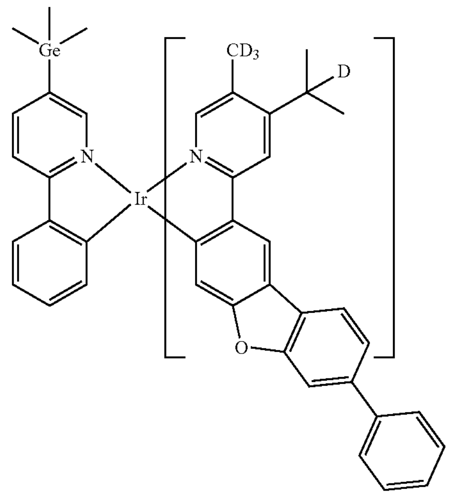
5000
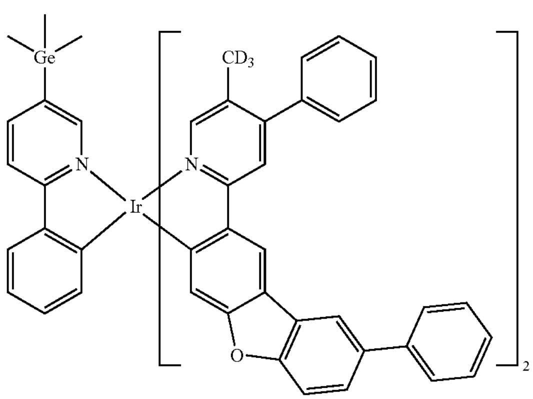

-continued
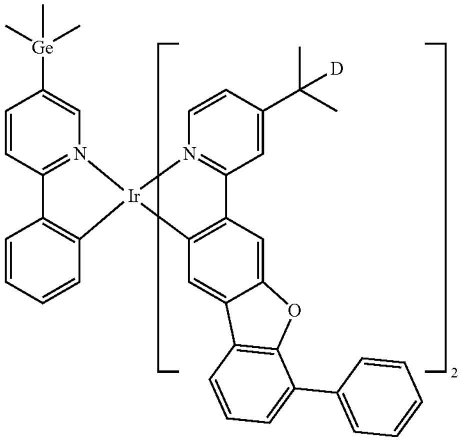
5001
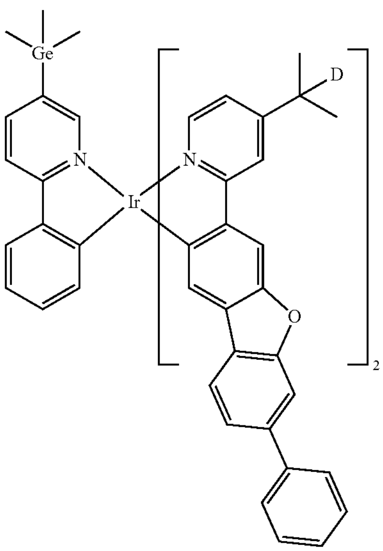
5002
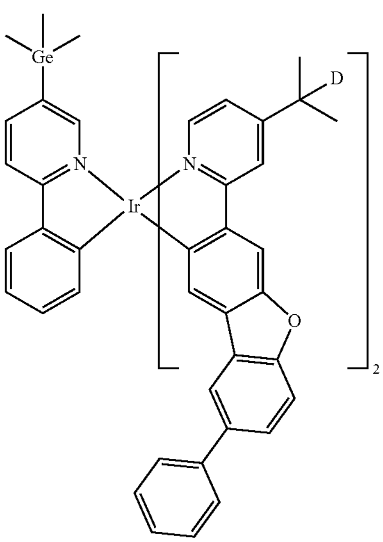
5003
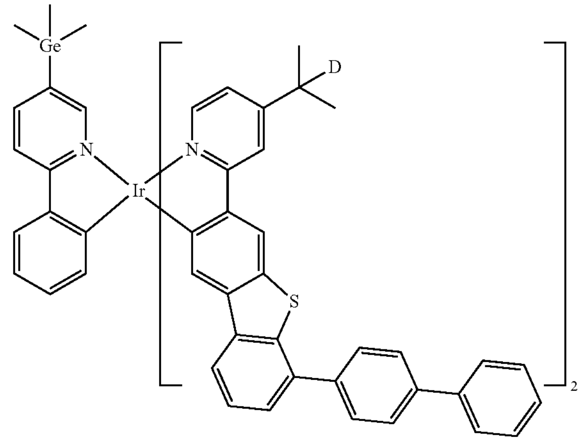
5004
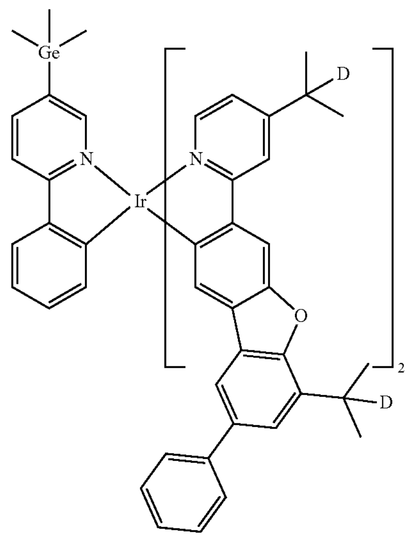
5005
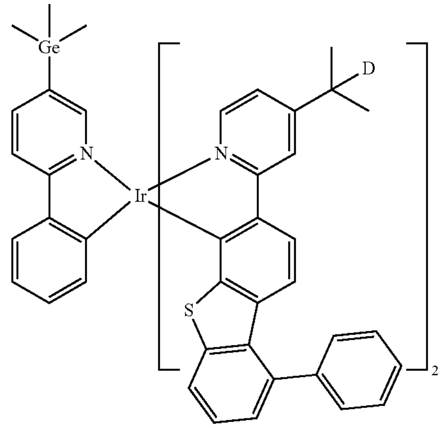
5006

5007
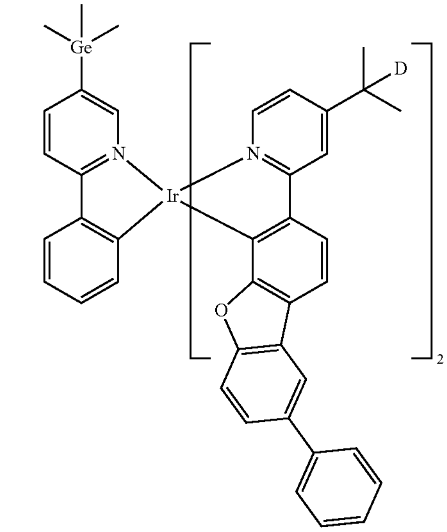
5008
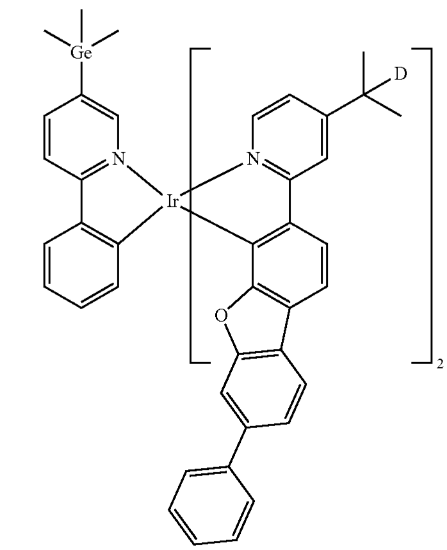
5009
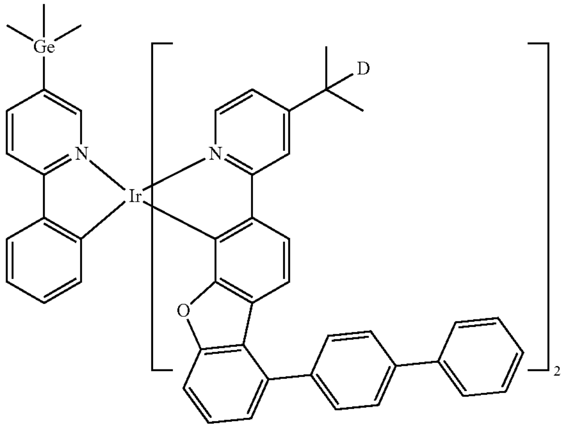
5010
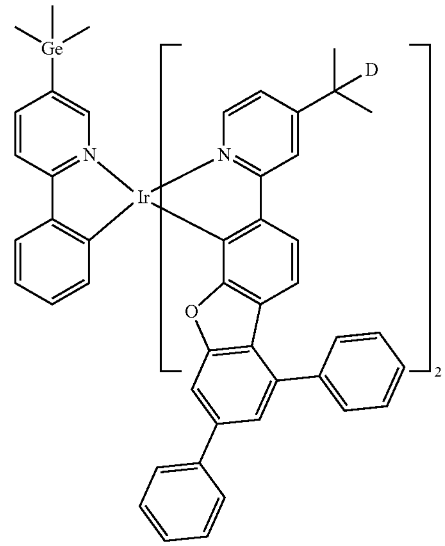
5011
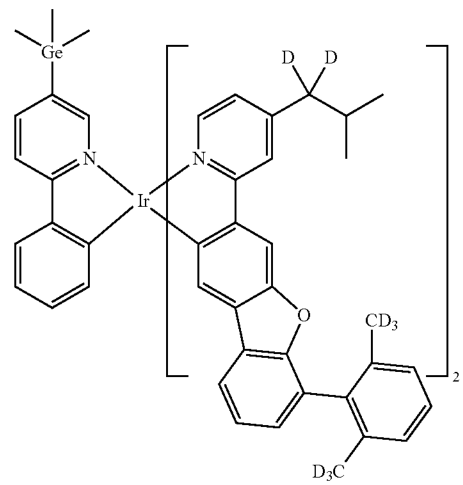
5012
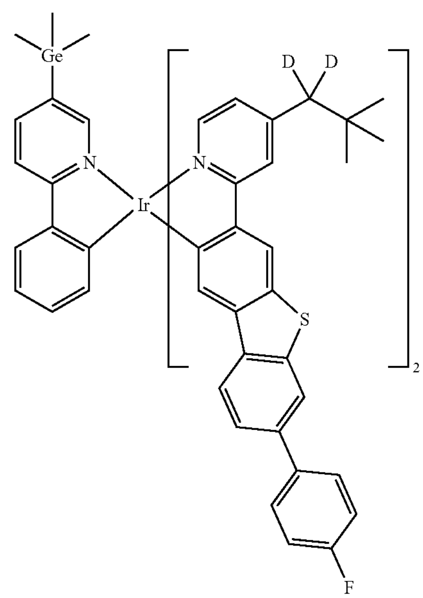

5013
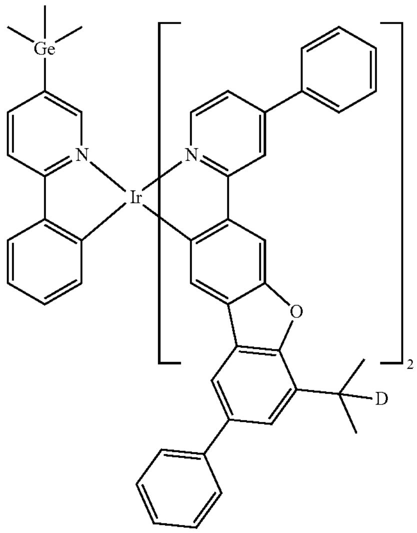
5014
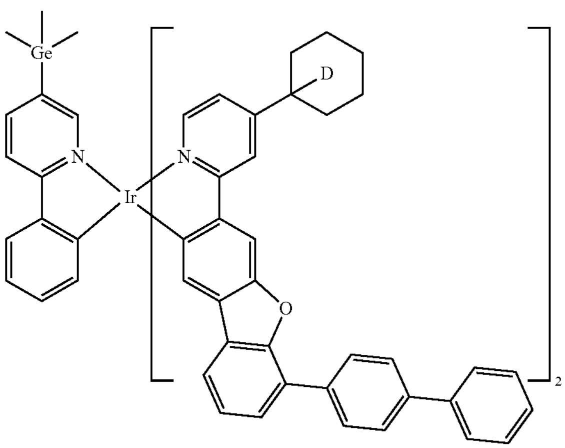
5015
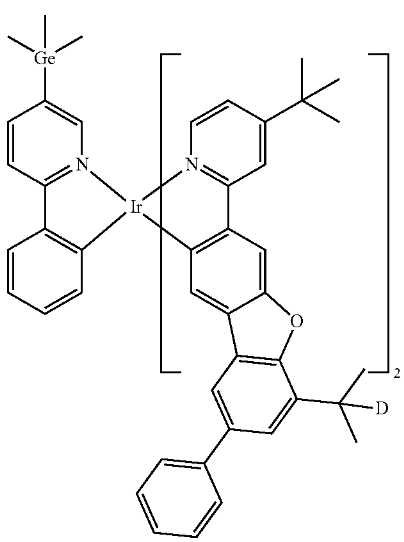
5016
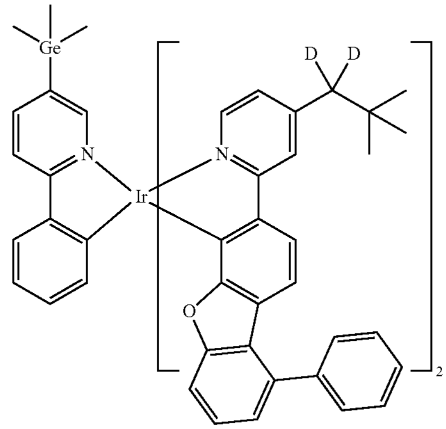
5017
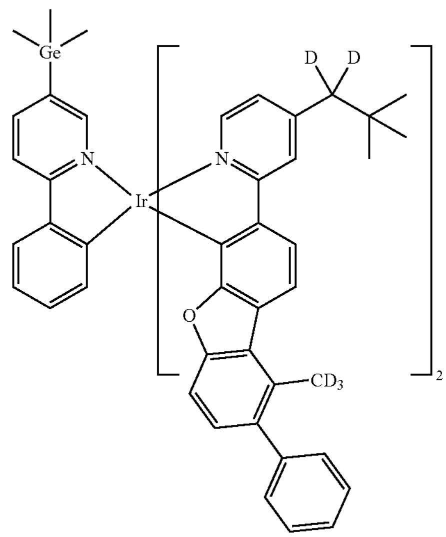
5018
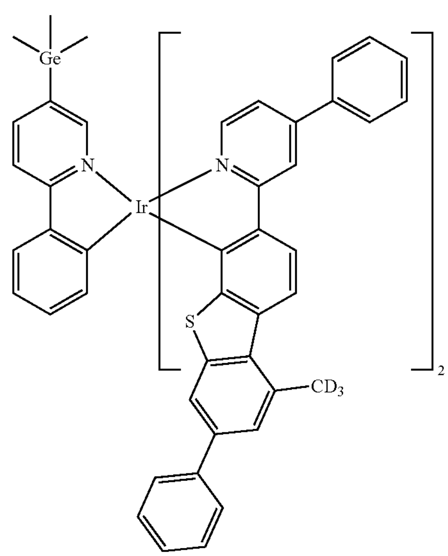

-continued
5019
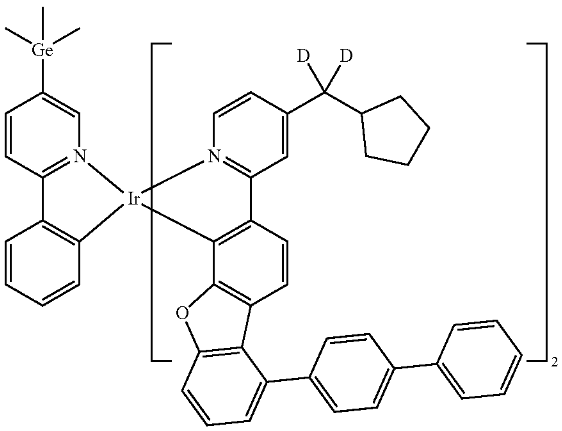
5020
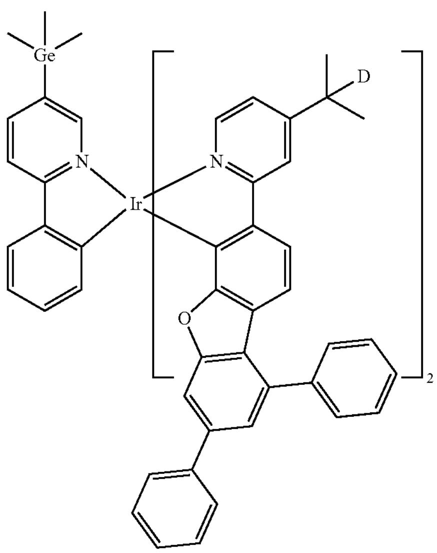
5021
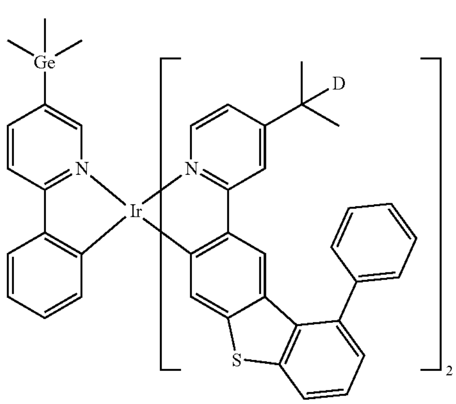
-continued
5022
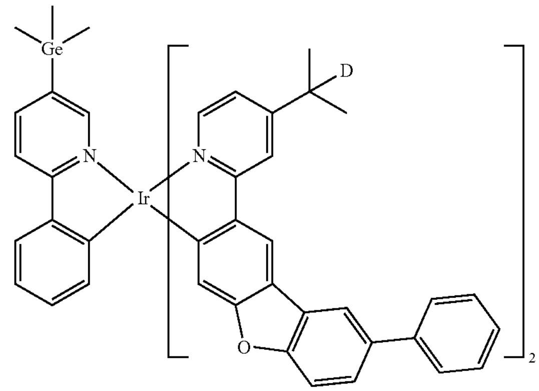
5023
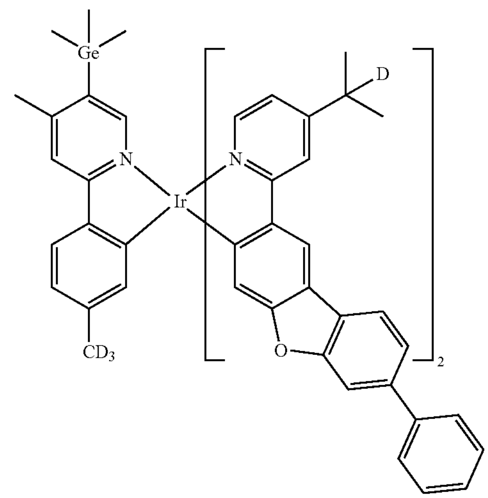
5024
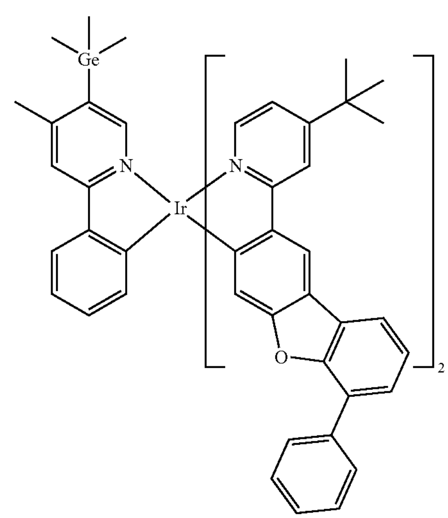

5025
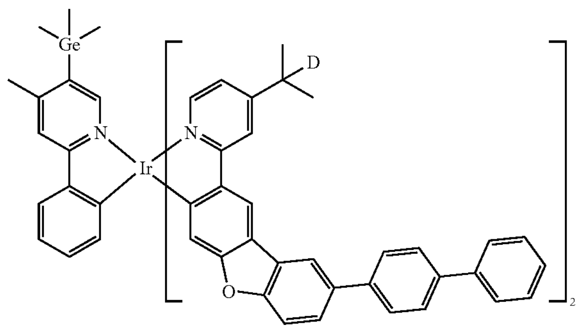
5026
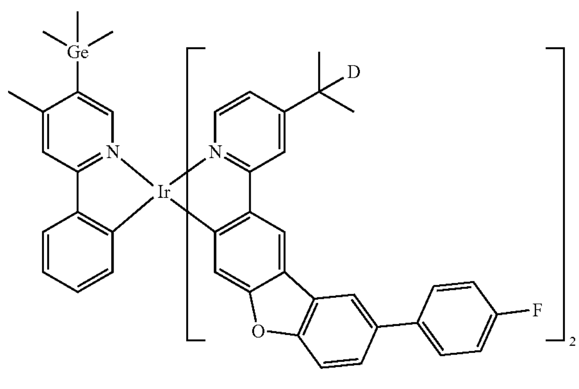
5027
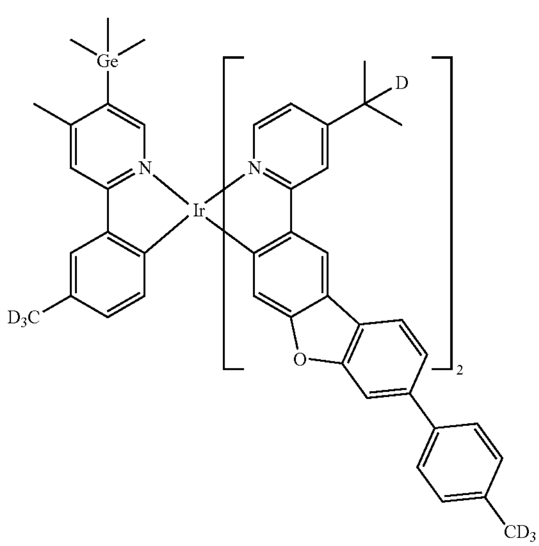
5028
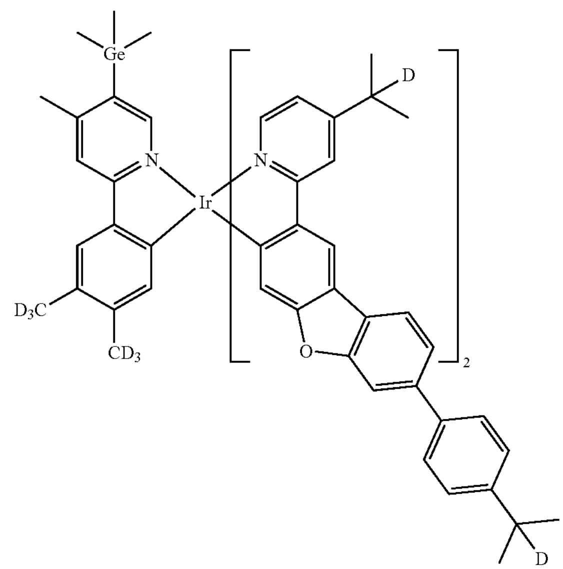
5029
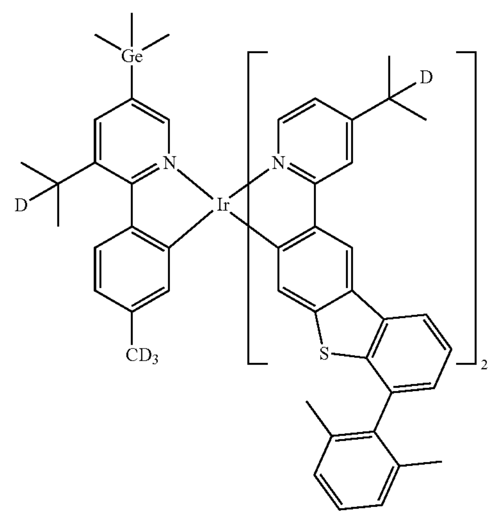
5030
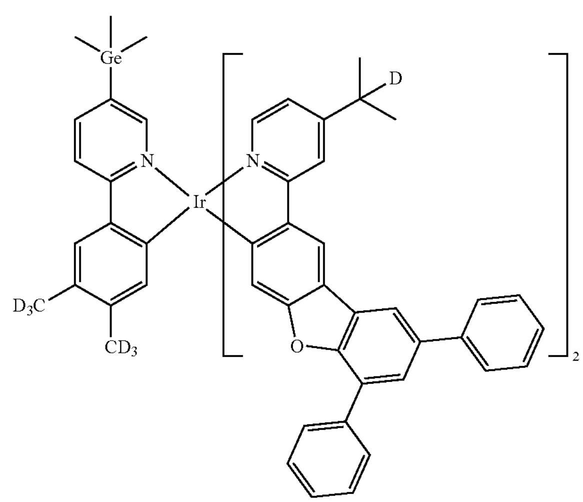

-continued
5031
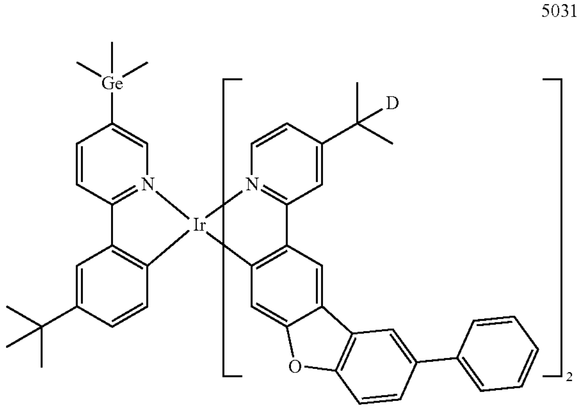
5032
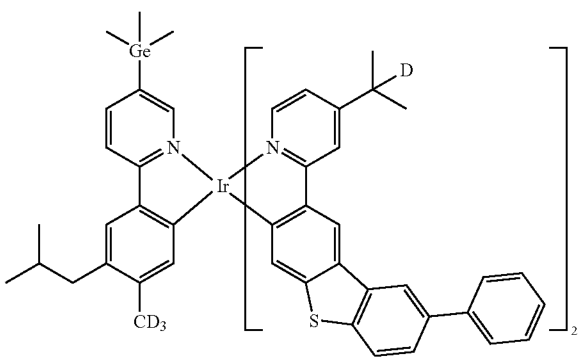
5033
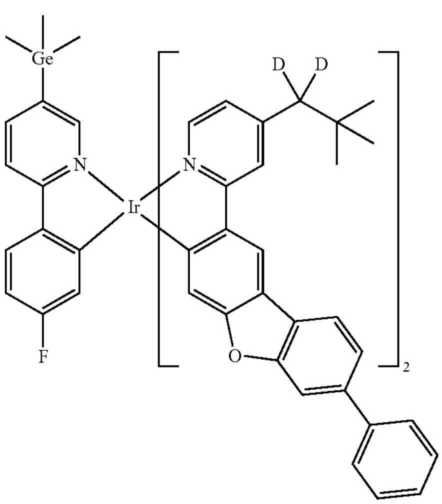
-continued
5034
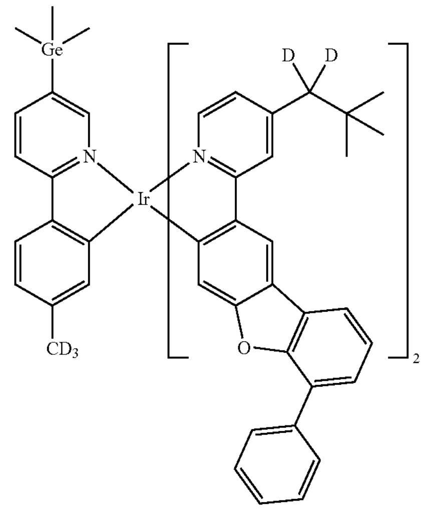
5035
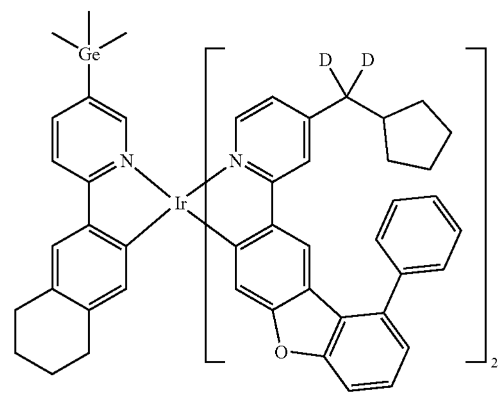
5036
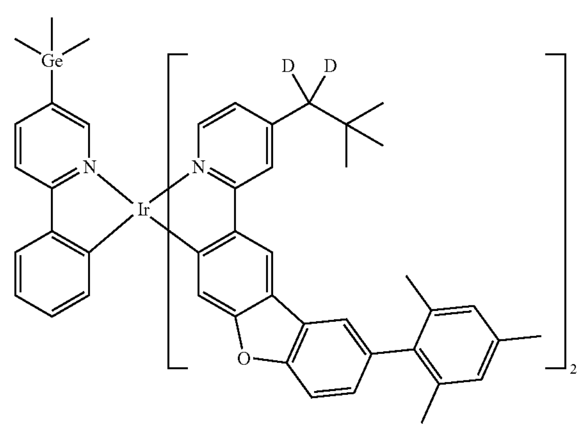

-continued
5037
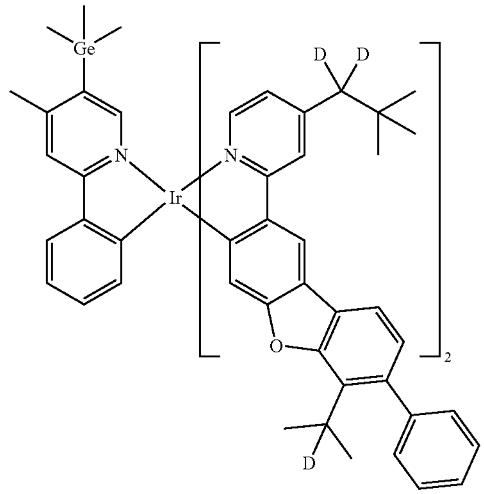
5038
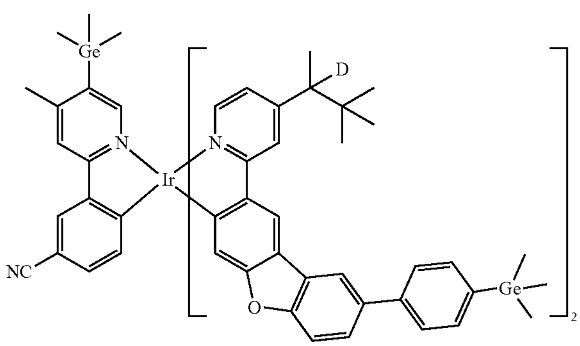
5039
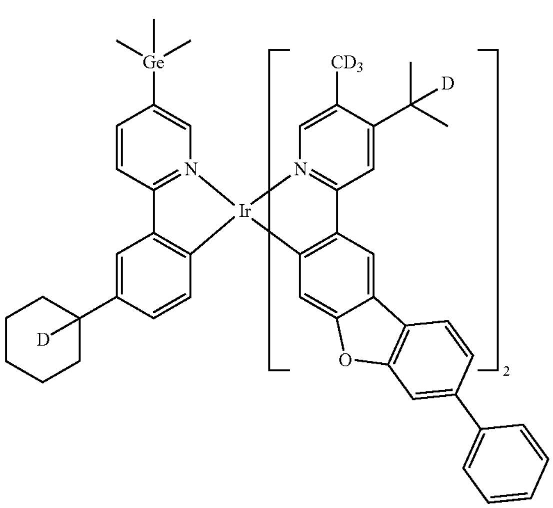
-continued
5040
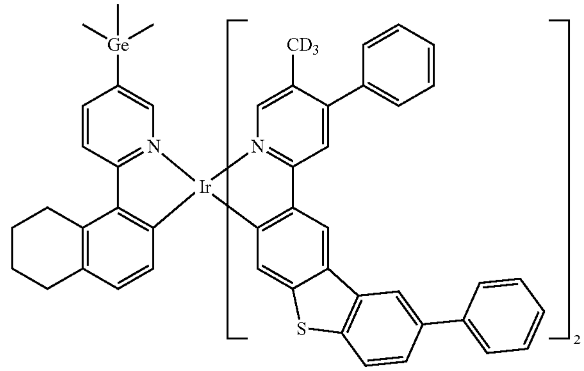
5041
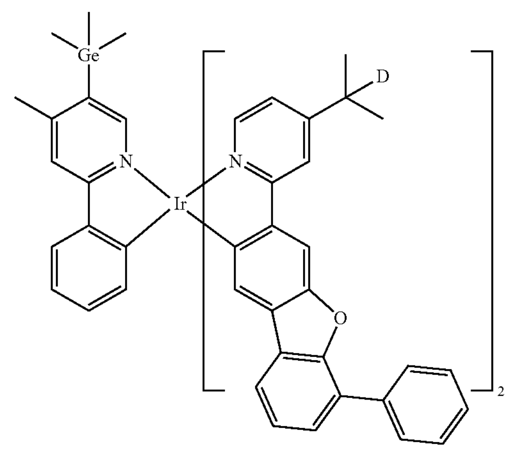
5042
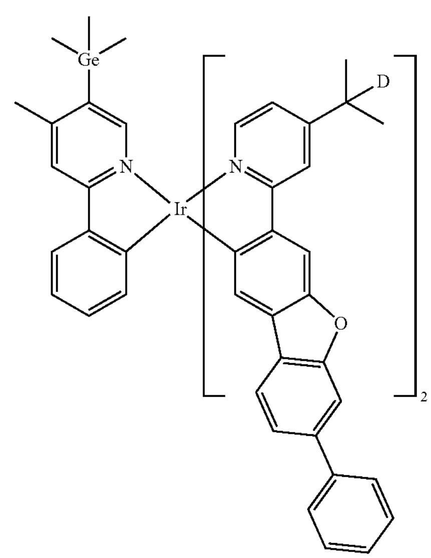

5043
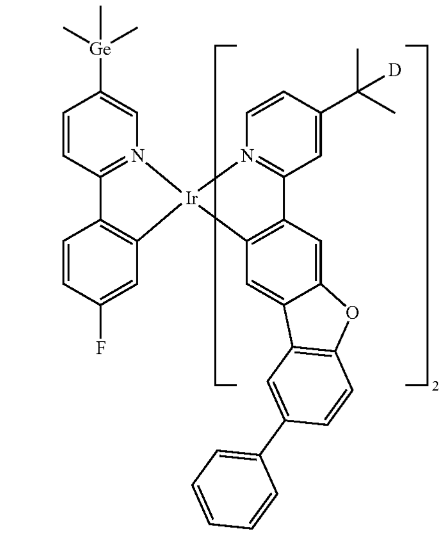
5044
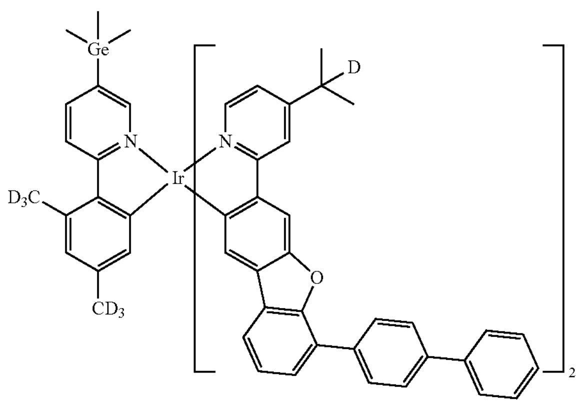
5045
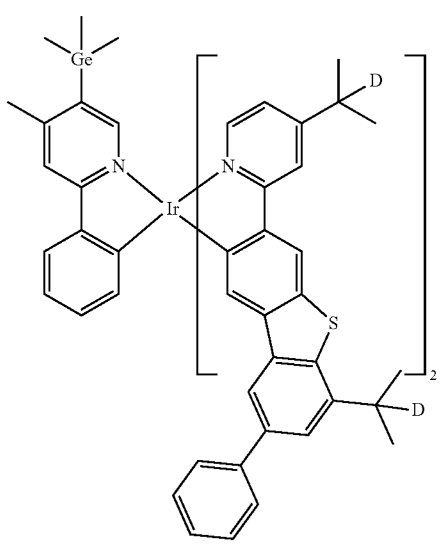
5046
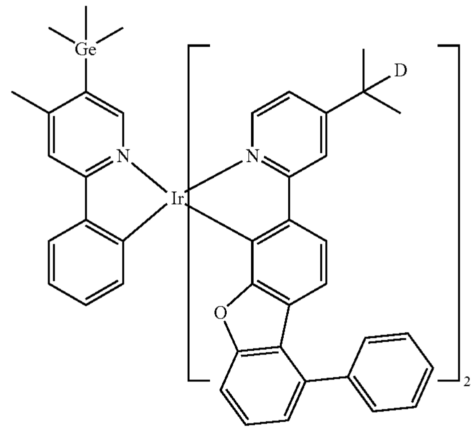
5047
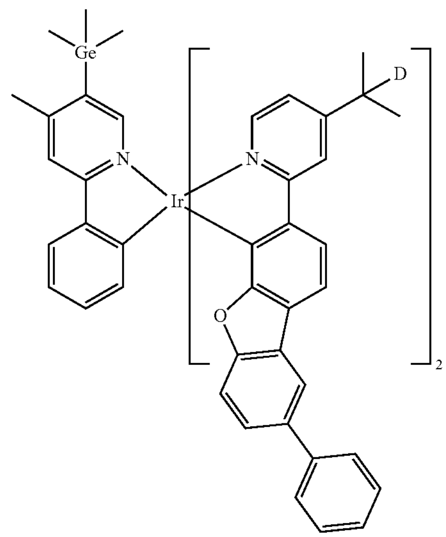
5048
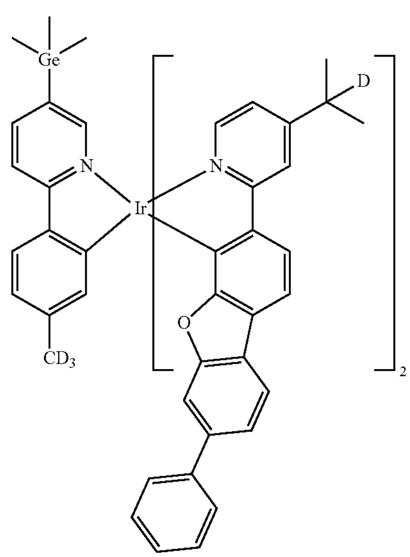

5049
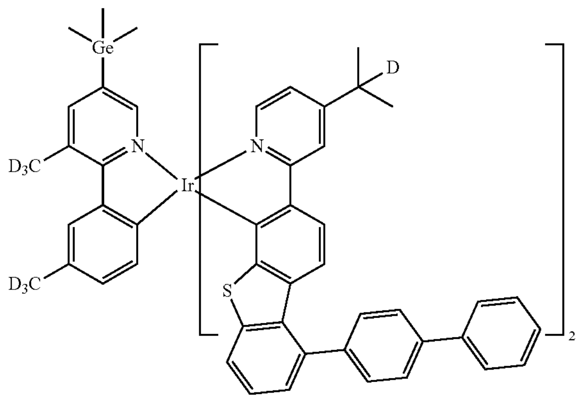
5050
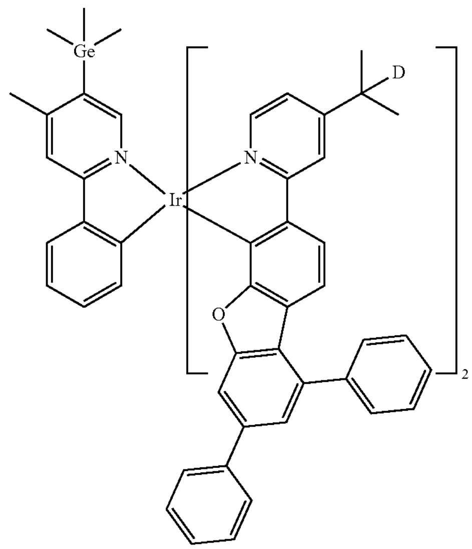
5051
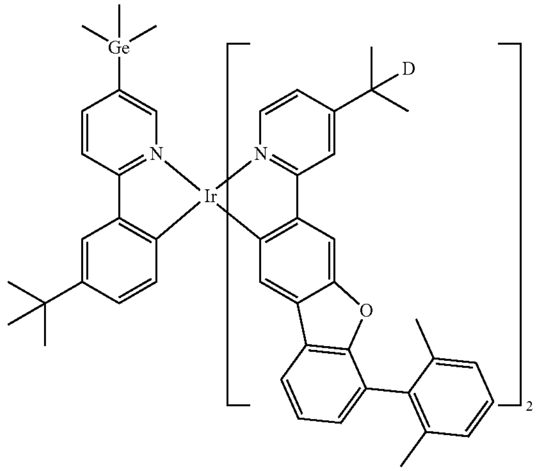
5052
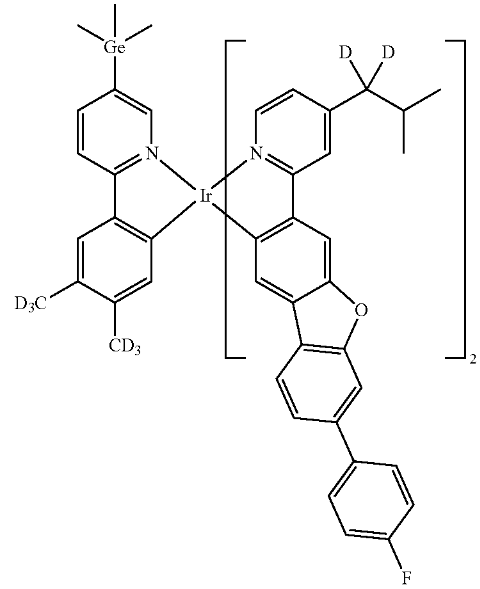
5053
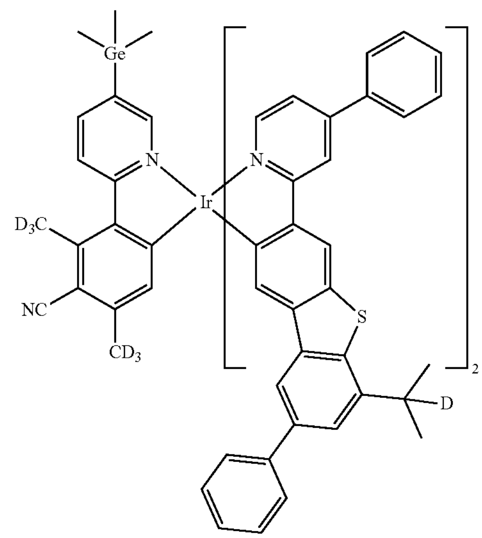
5054
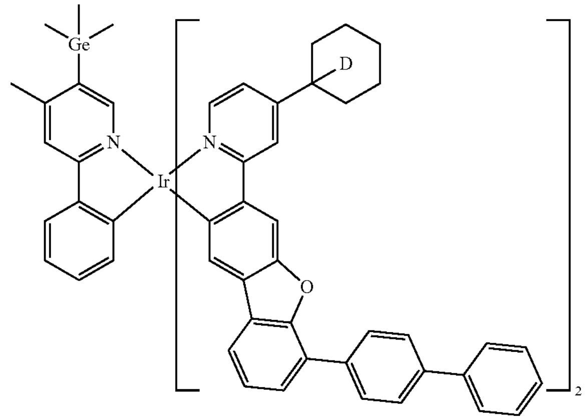

-continued
5055
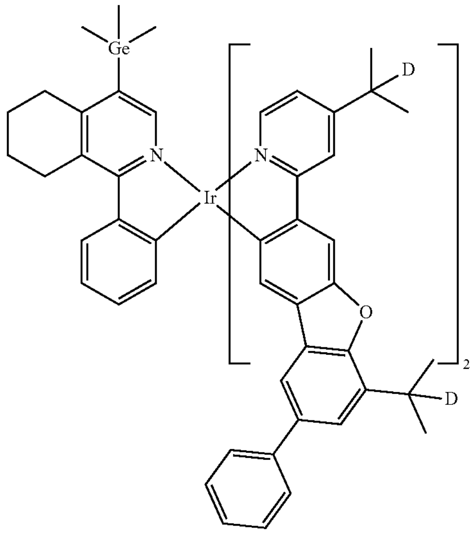
5056
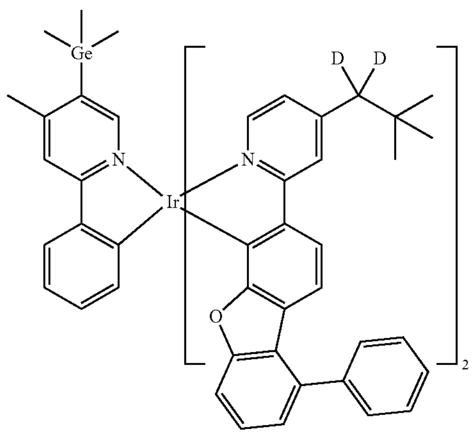
5057
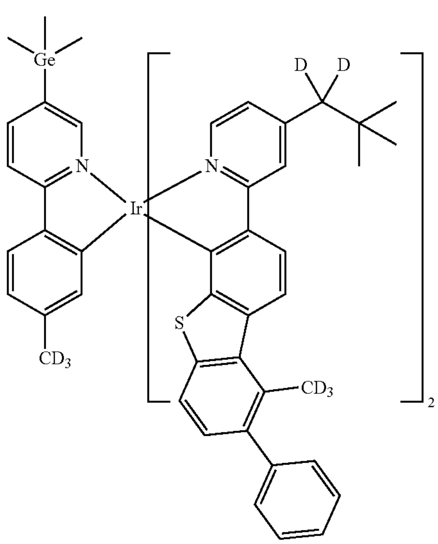
-continued
5058
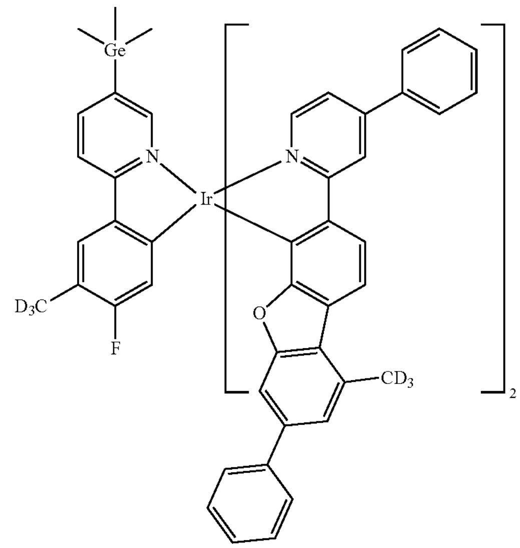
5059
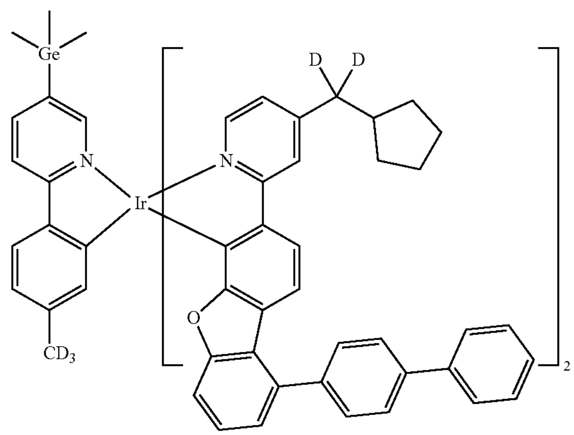
5060
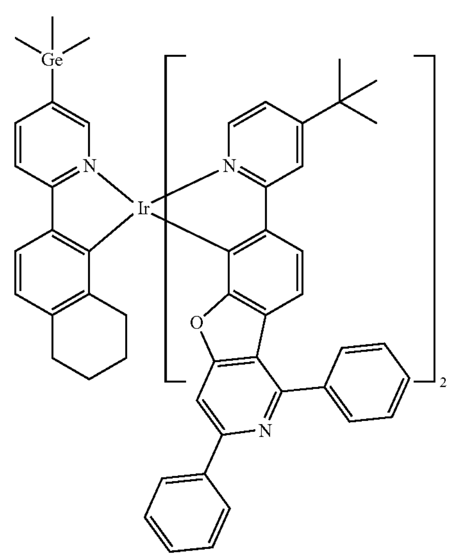

-continued
5061
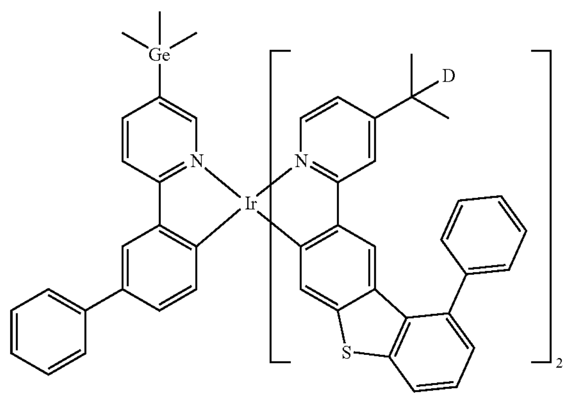
5062
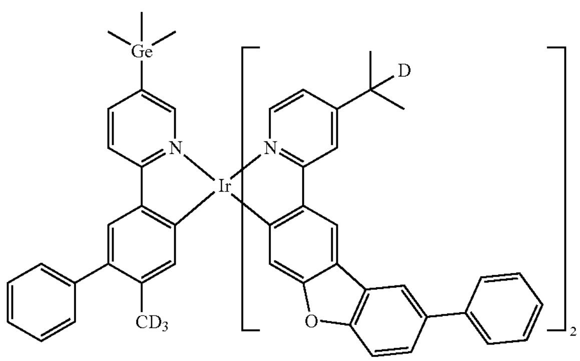
5063
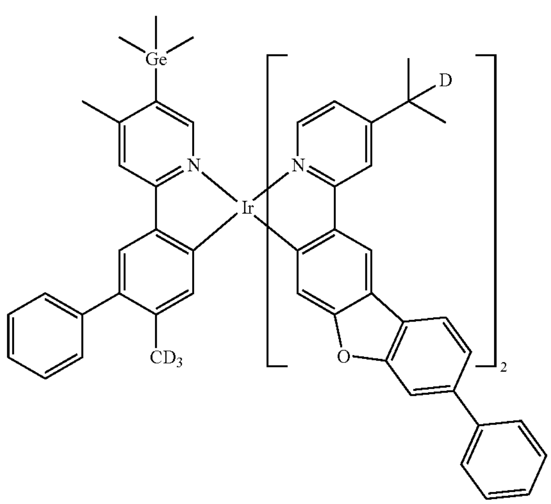
-continued
5064
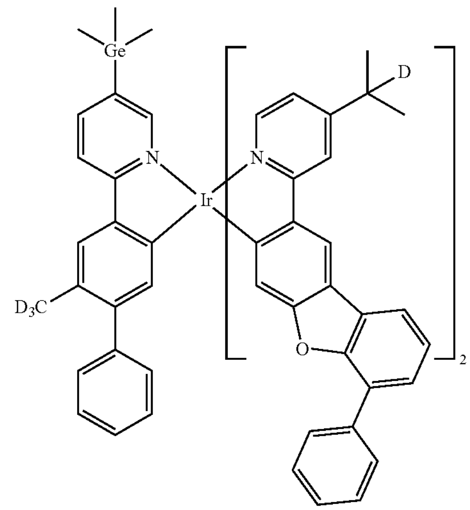
5065
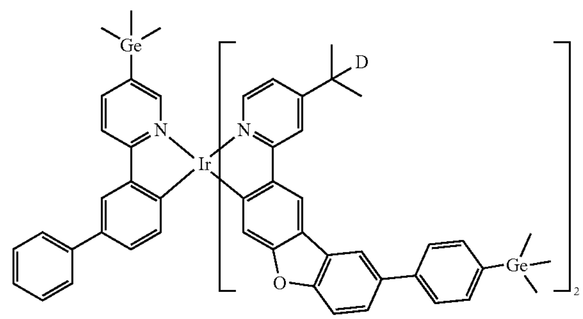
5066
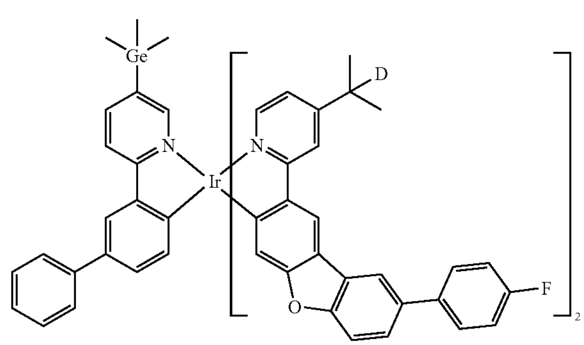

-continued
5067
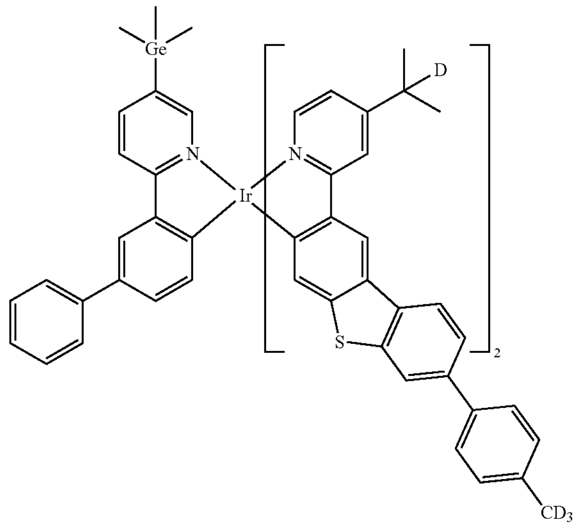
5068
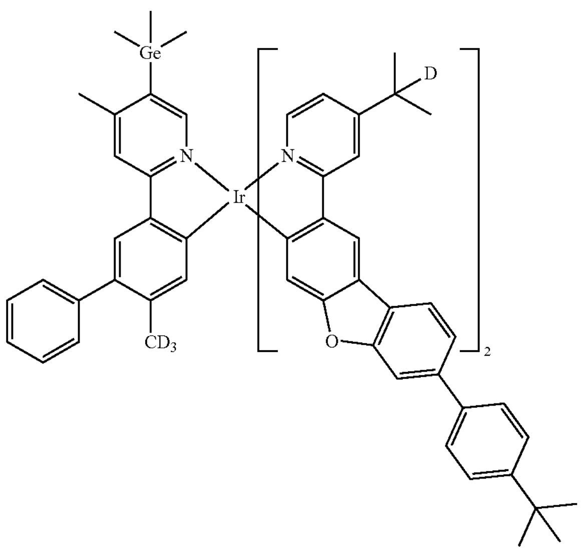
5069
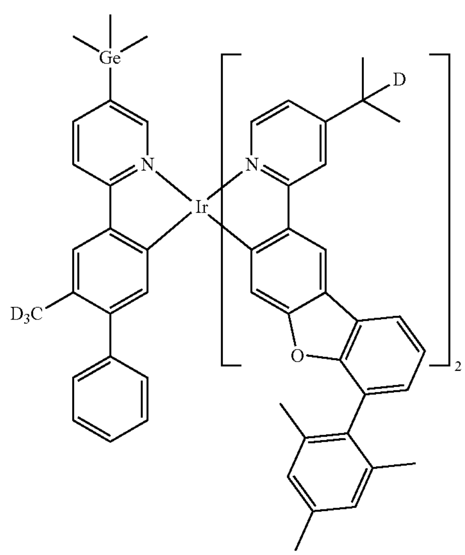
-continued
5070
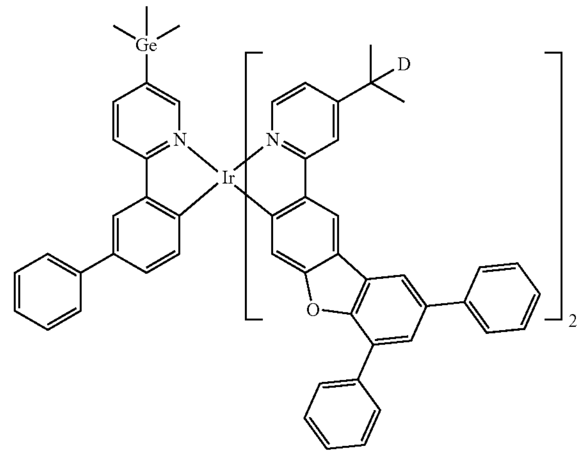
5071
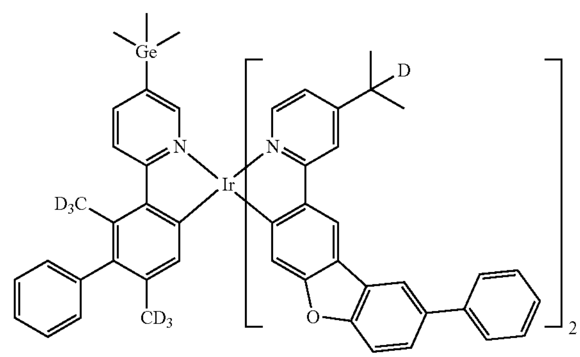
5072
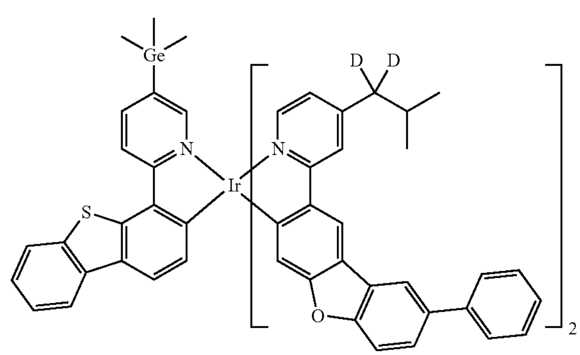

-continued
5073
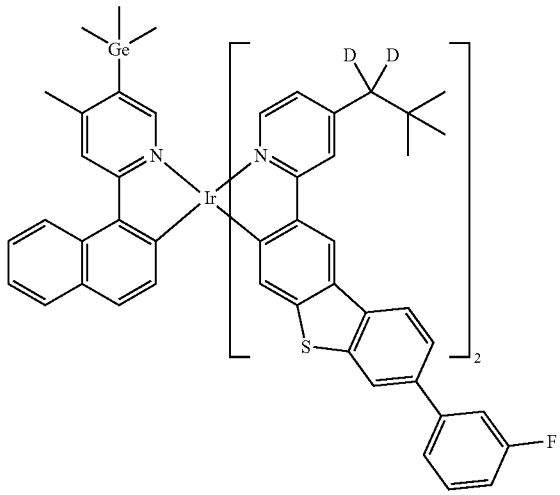
5074
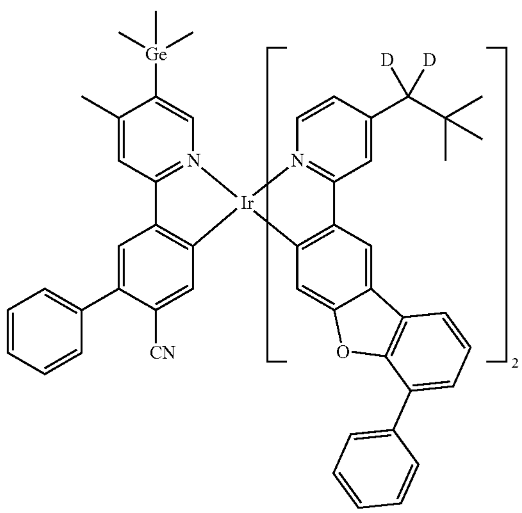
5075
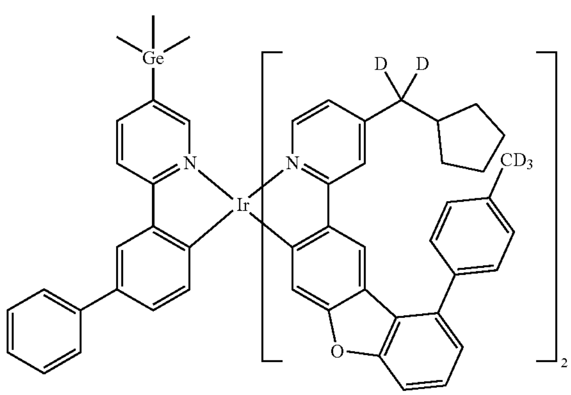
-continued
5076
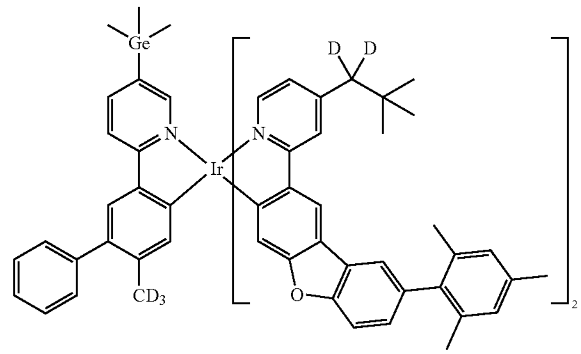
5077
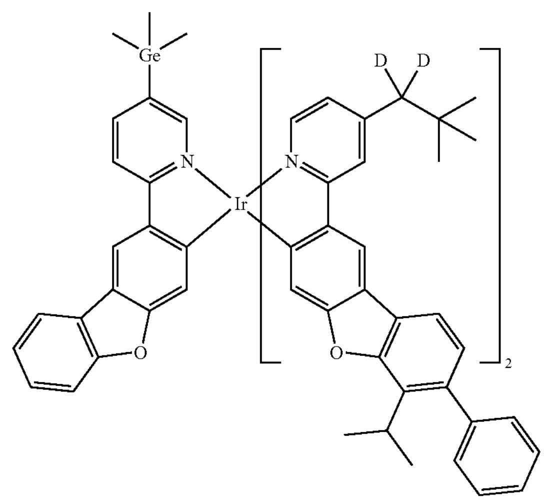
5078
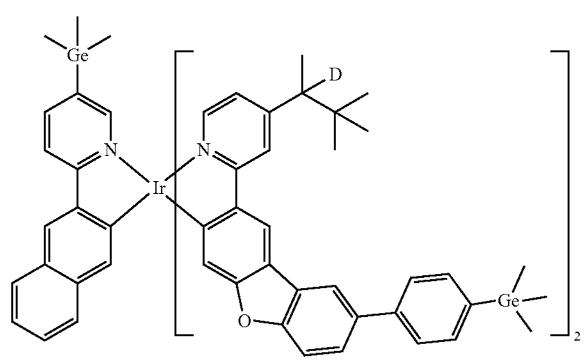

-continued
5079
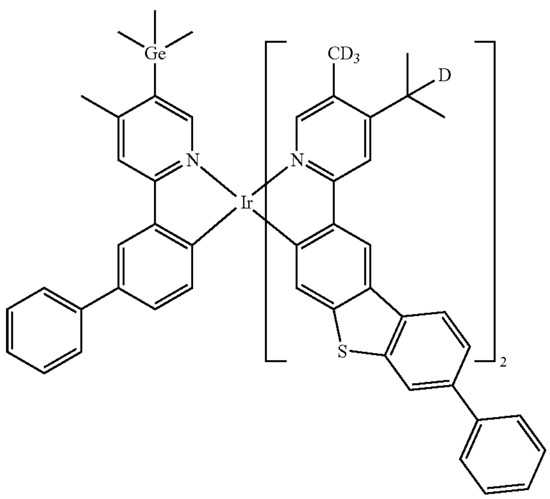
5080
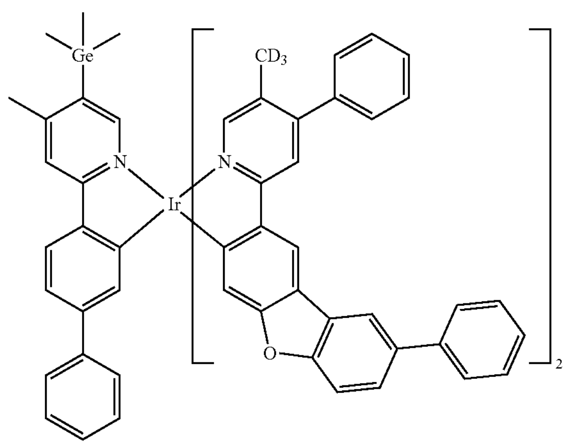
5081
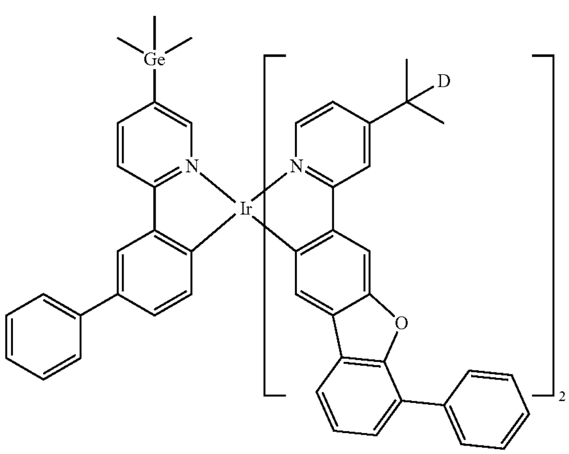
-continued
5082
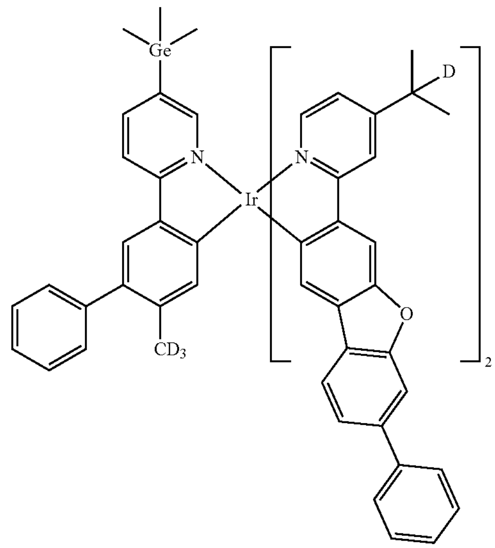
5083
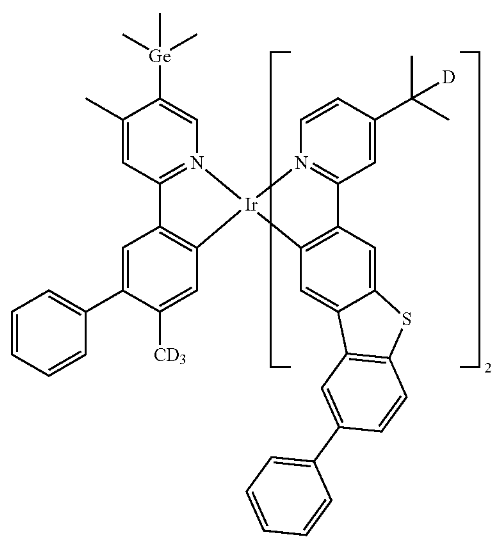
5084
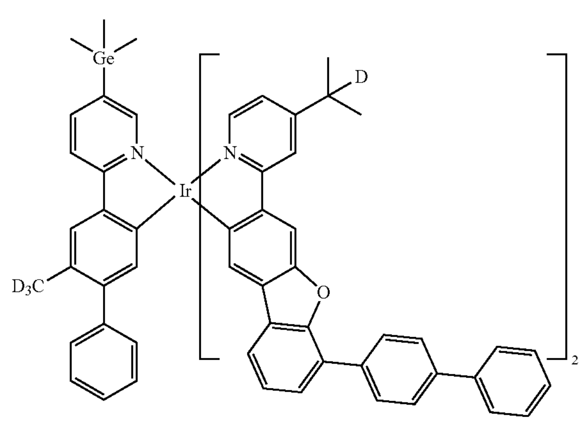

-continued
5085
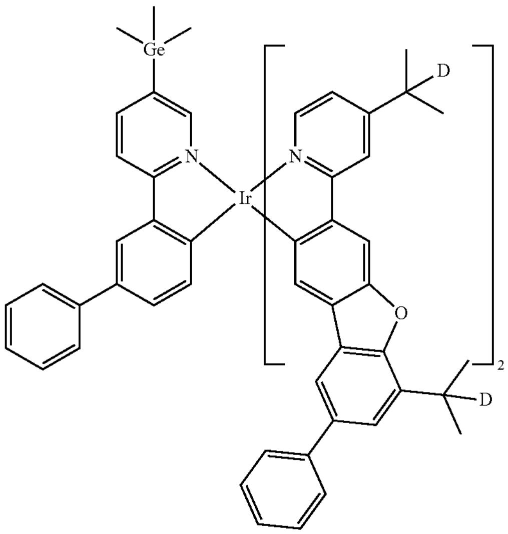
5086
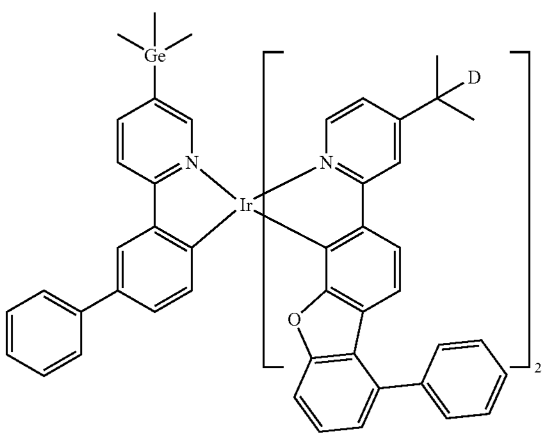
5087
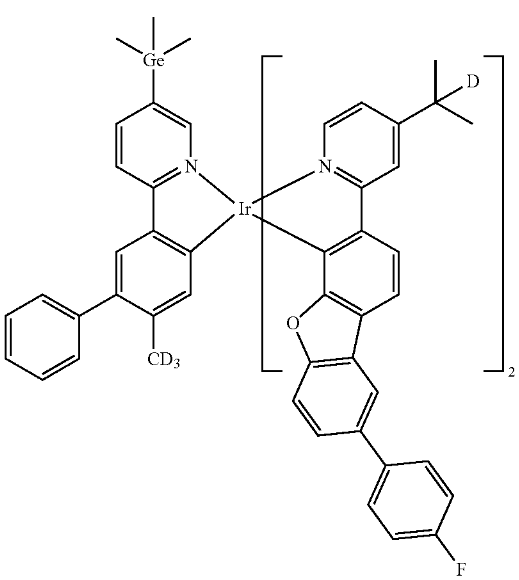
-continued
5088
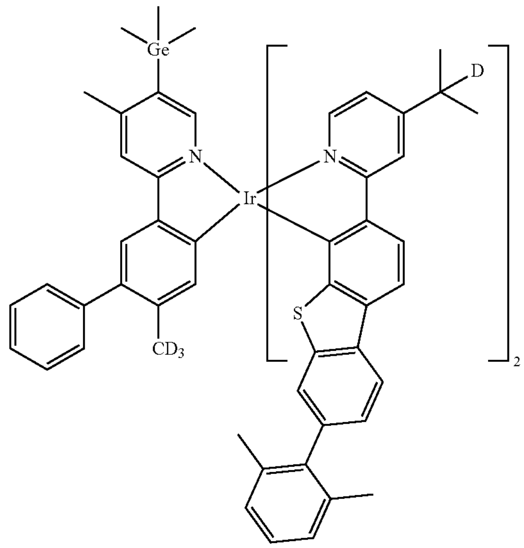
5089
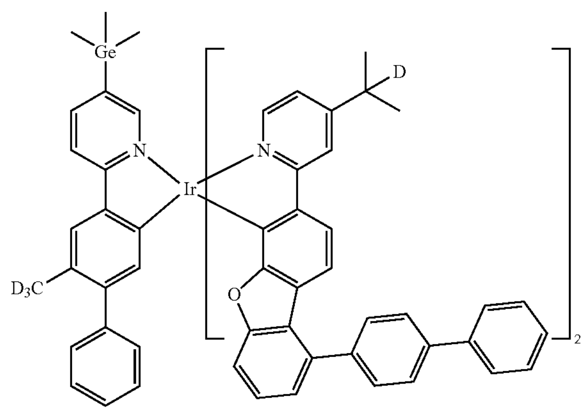
5090
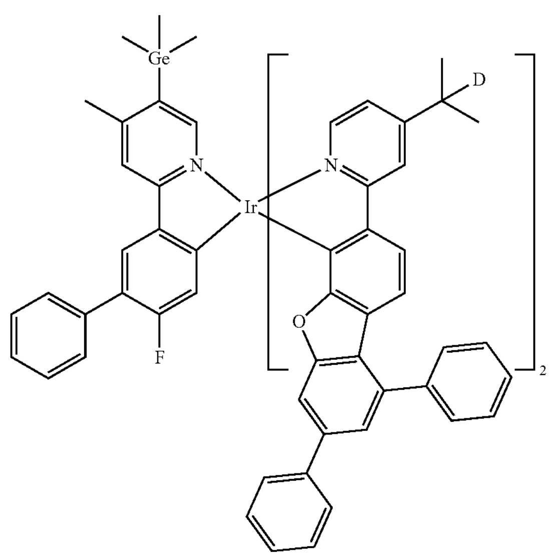

-continued
5091
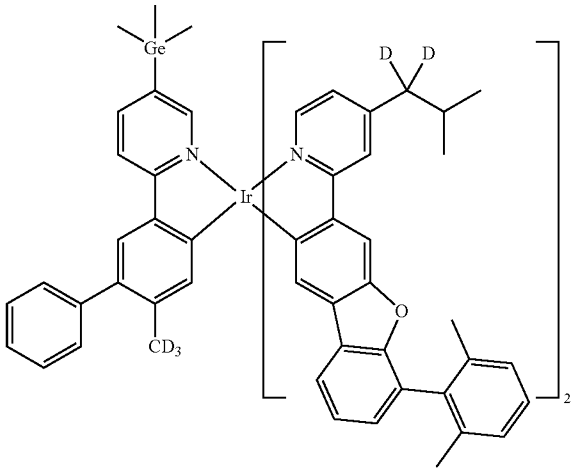
5092
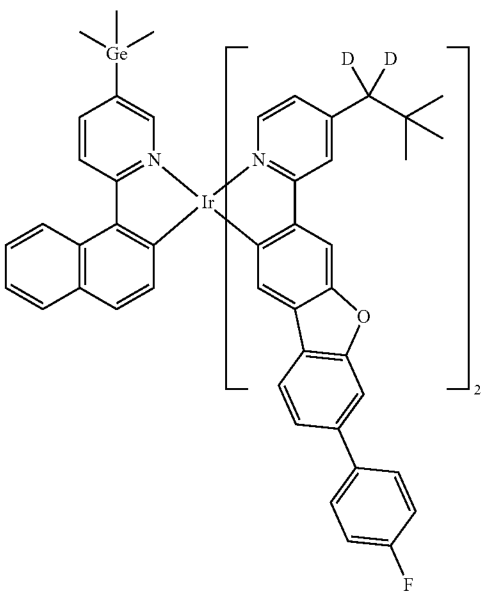
5093
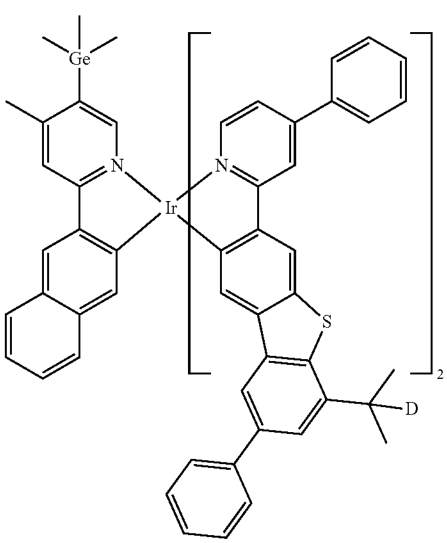
-continued
5094
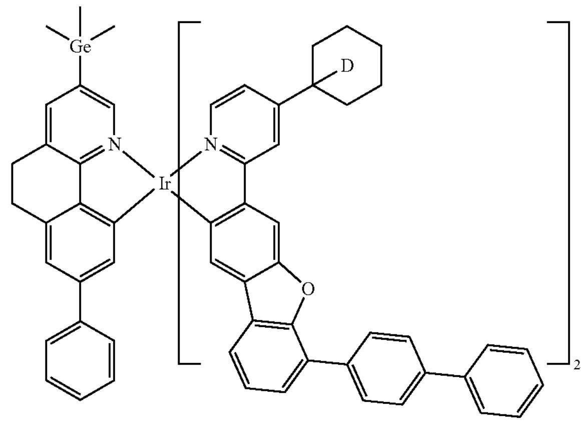
5095
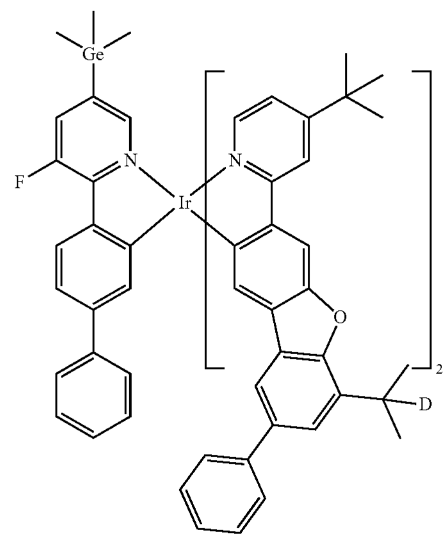
5096
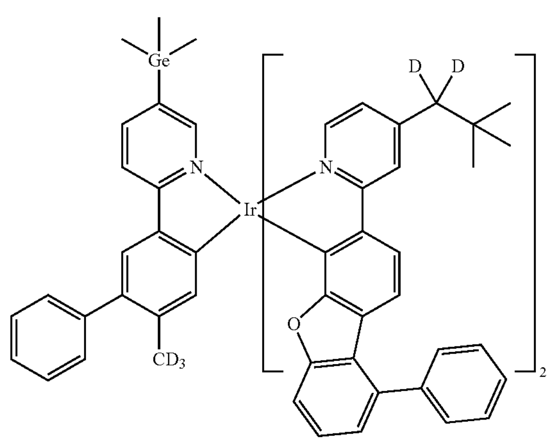

5097
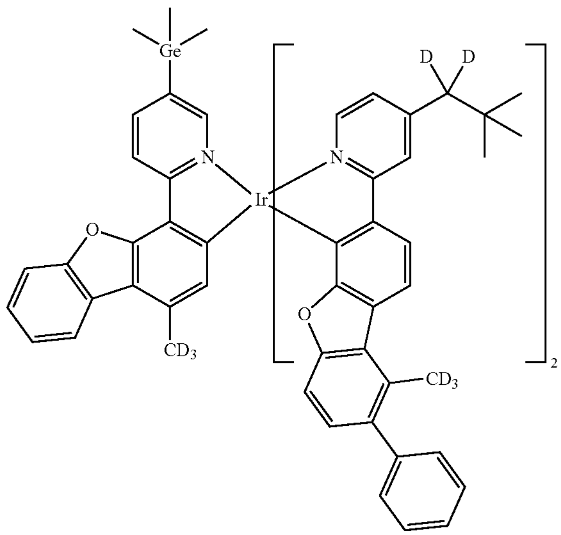
5098
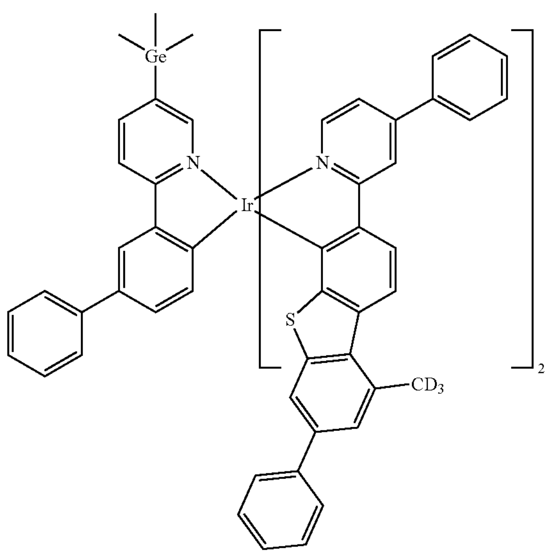
5099
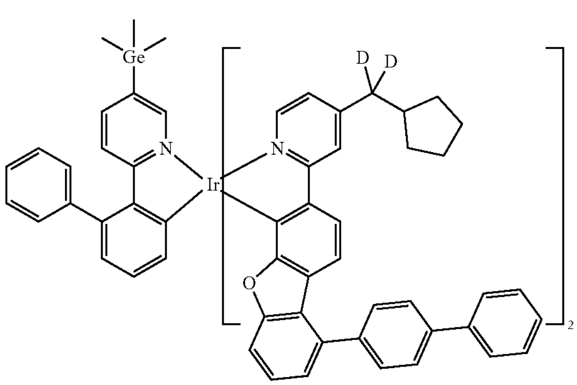
5100
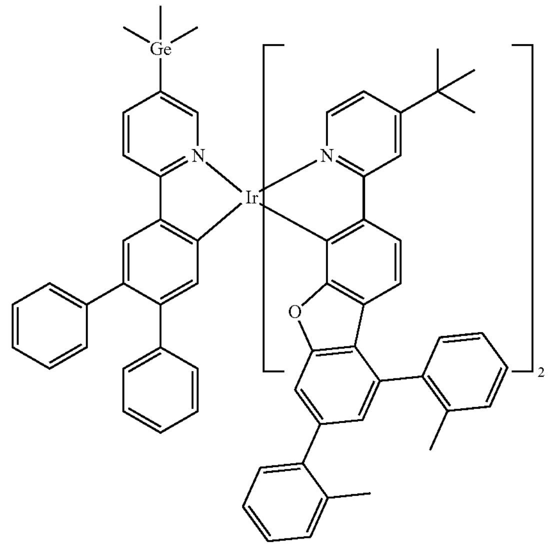
5101
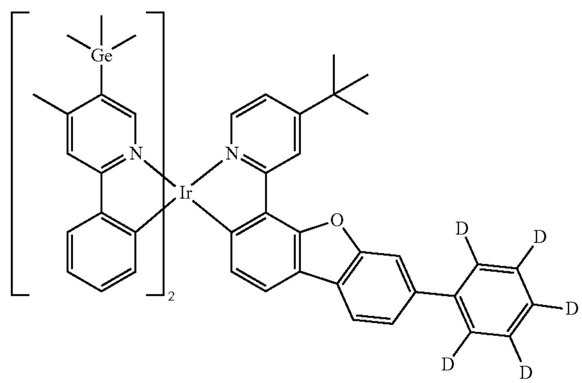
5102
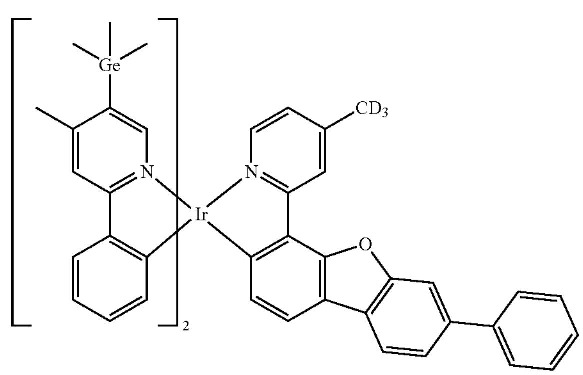

-continued
5103
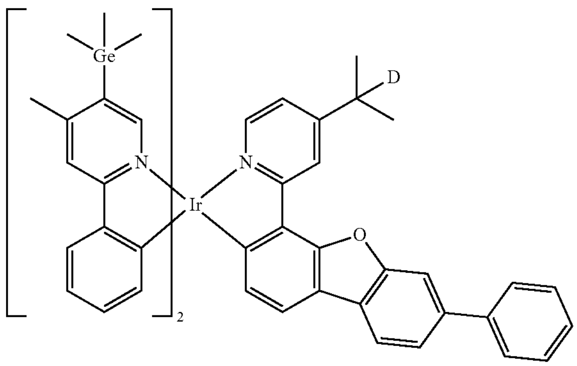
5104
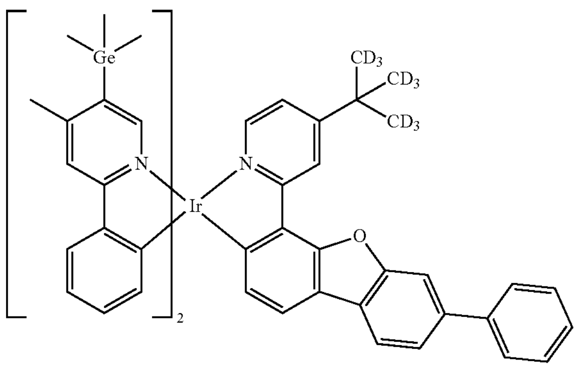
5105
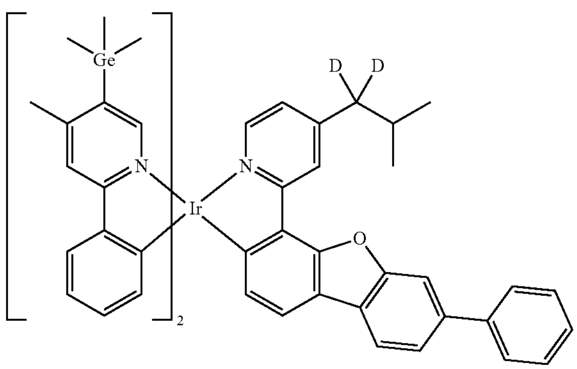
5106
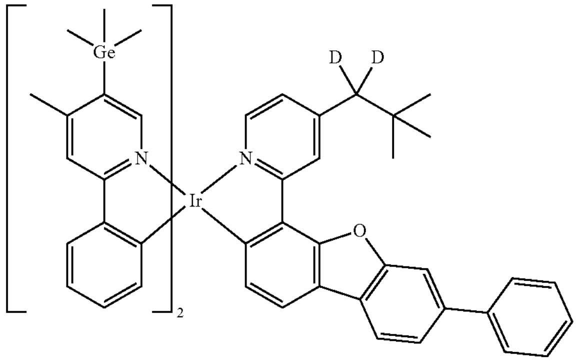
-continued
5107
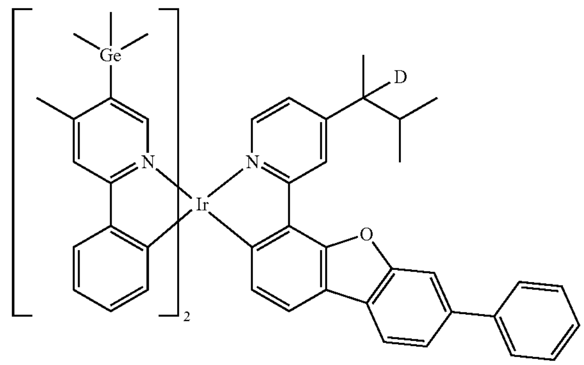
5108
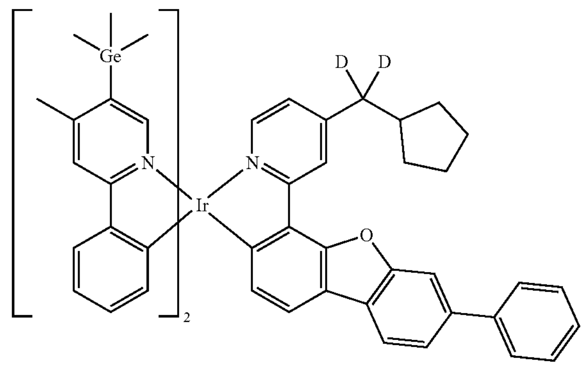
5109
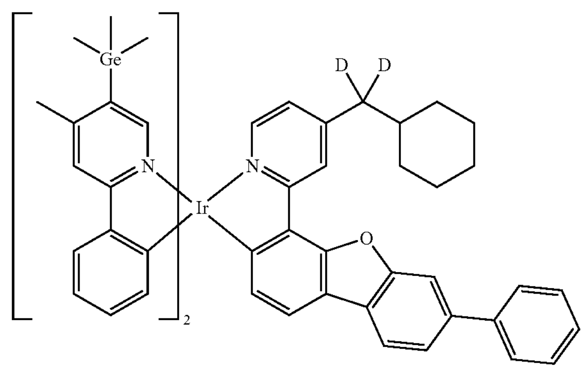
5110
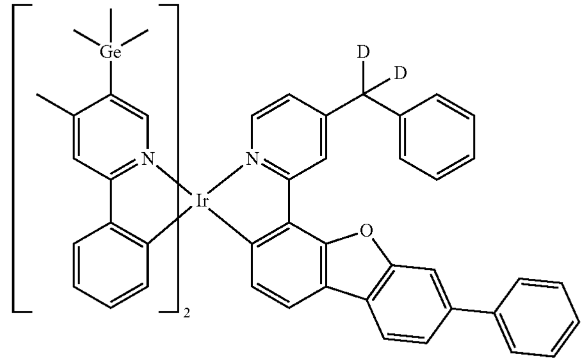

-continued
5111
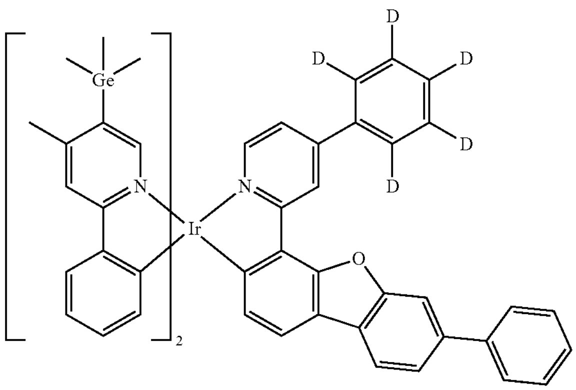
5112
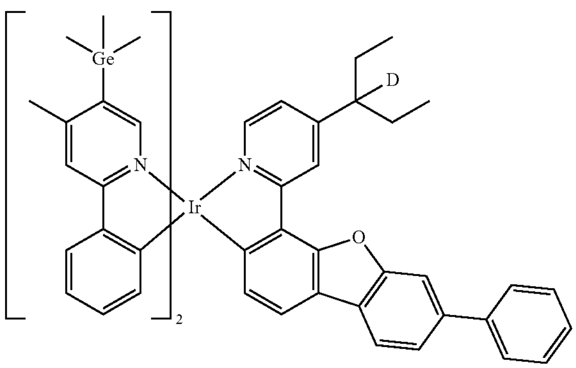
5113
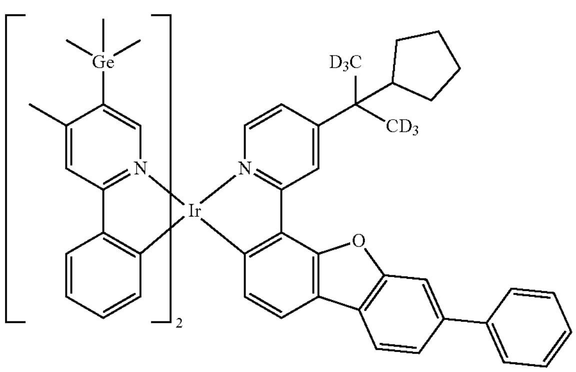
5114
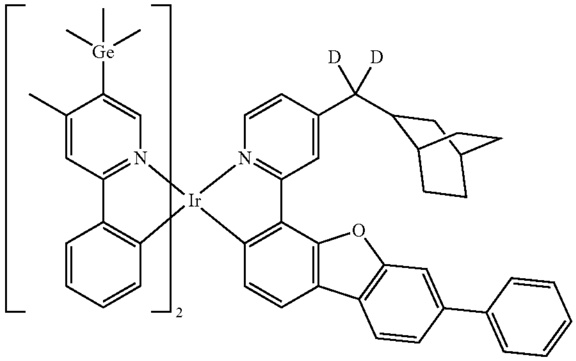
-continued
5115
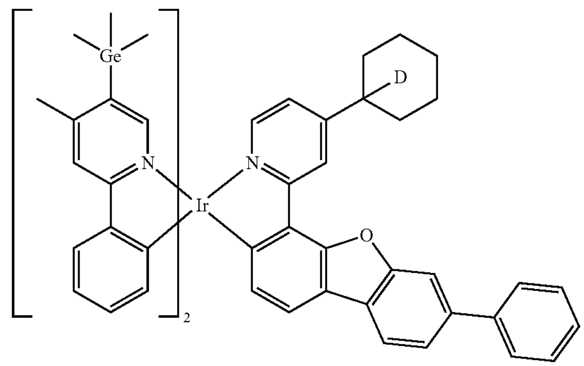
5116
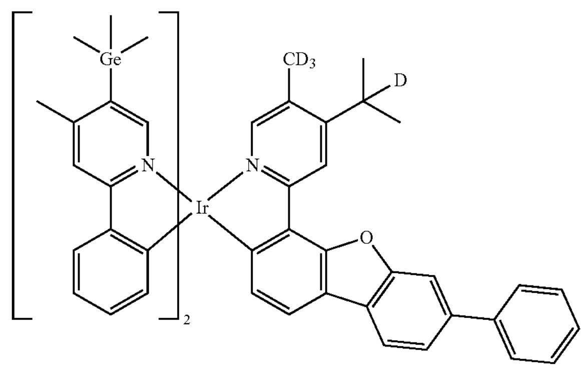
5117
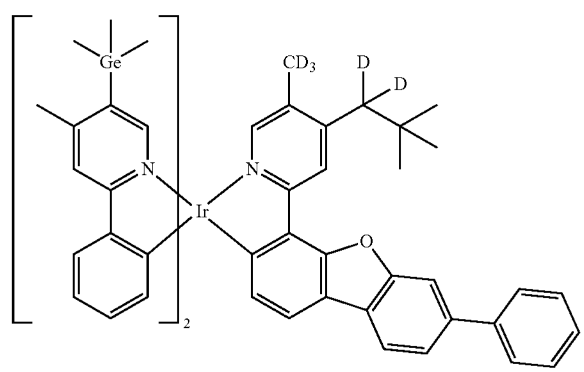
5118
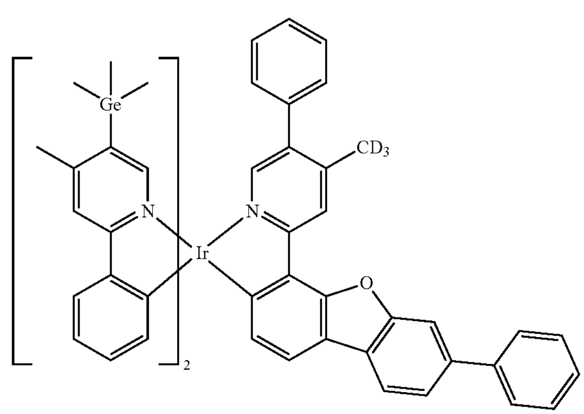

-continued
5119
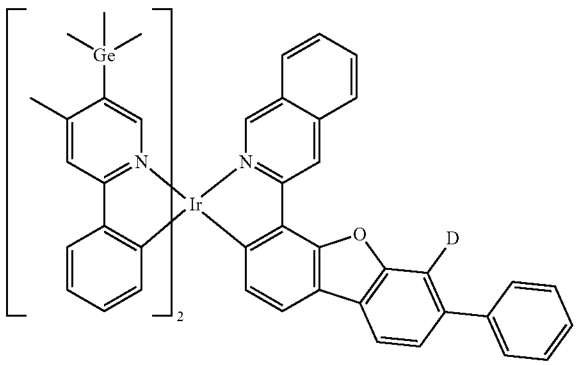
5120
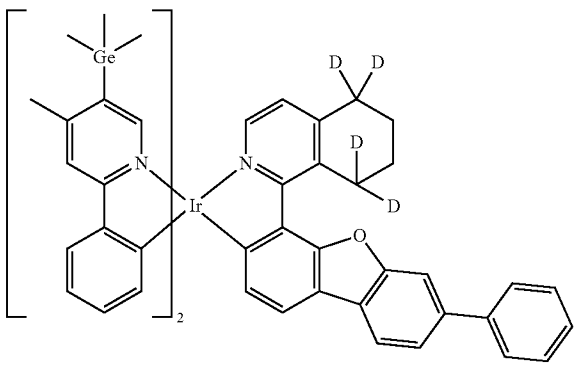
5121
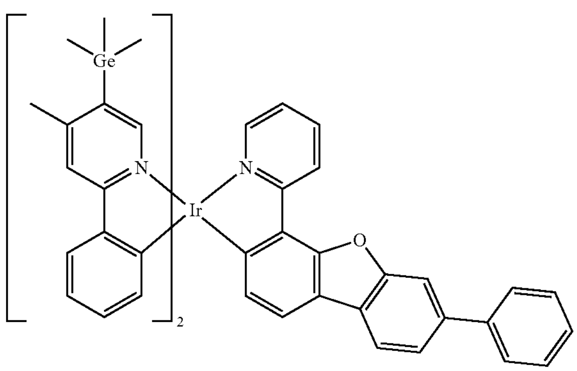
5122
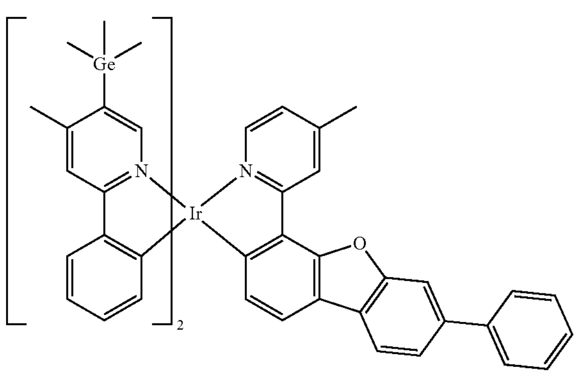
-continued
5123
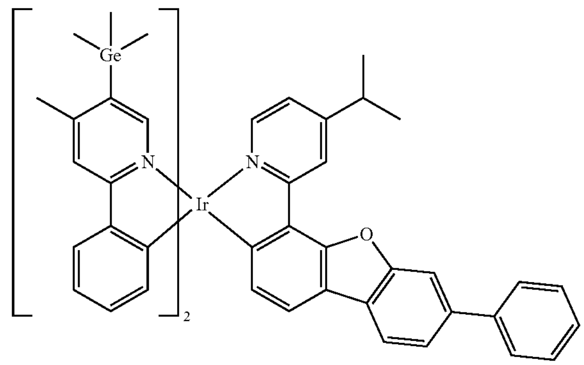
5124
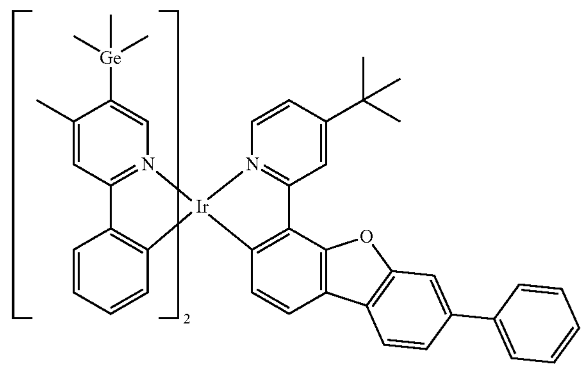
5125
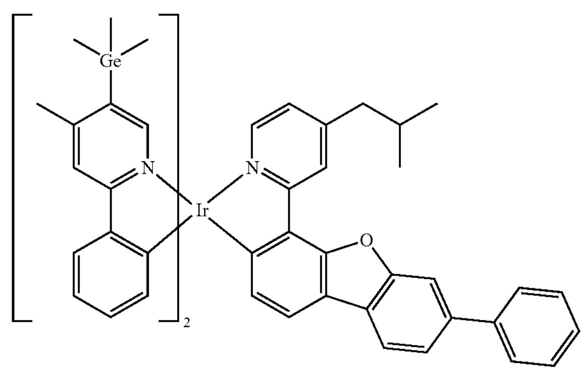
5126
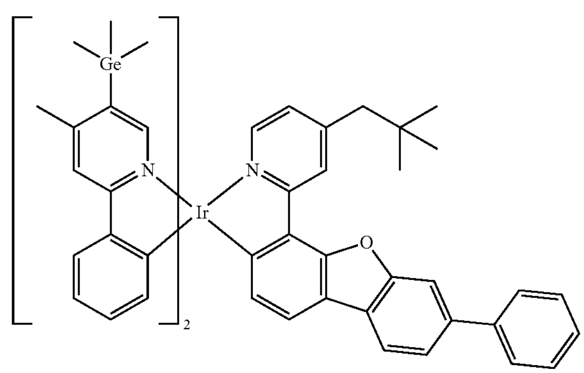

-continued
5127
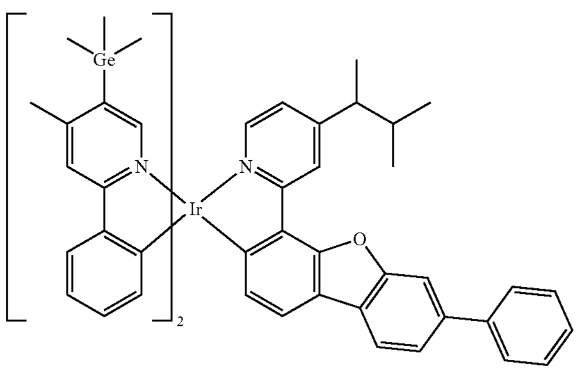
5128
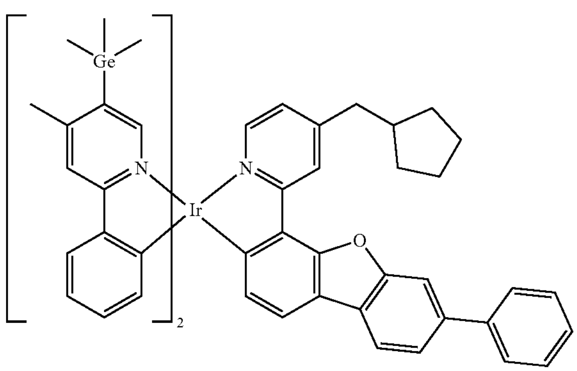
5129
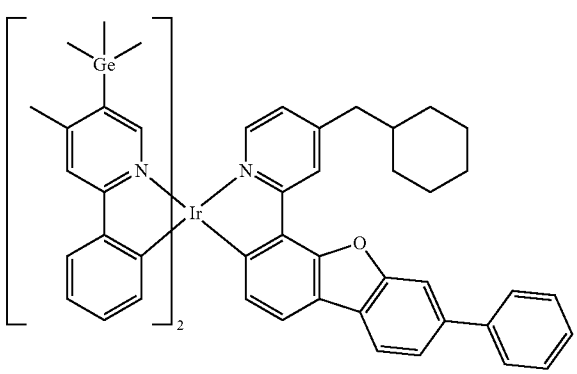
5130
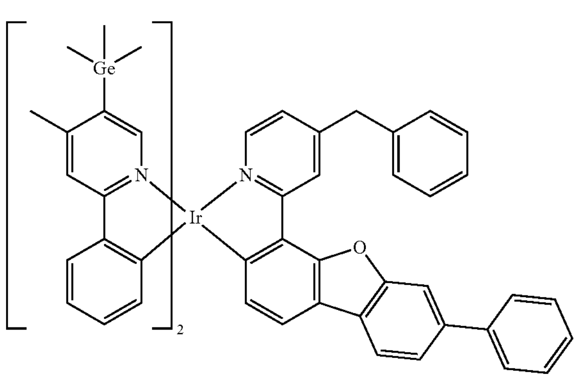
-continued
5131
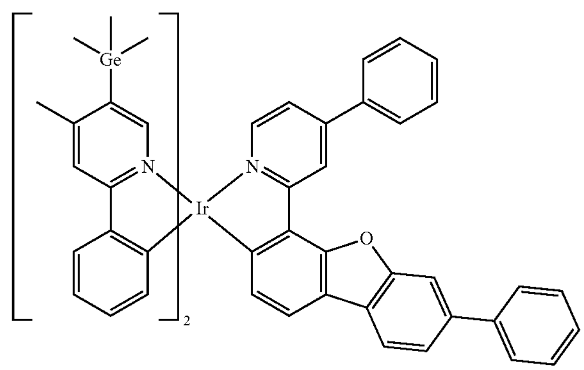
5132
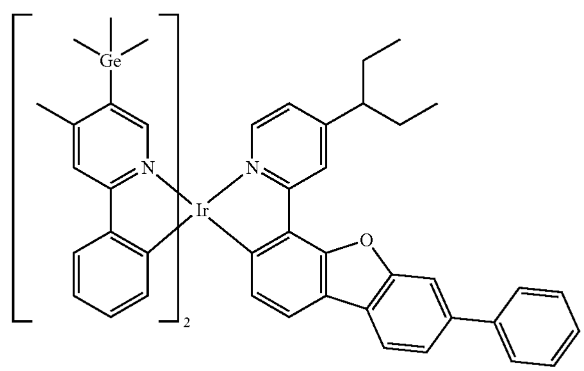
5133
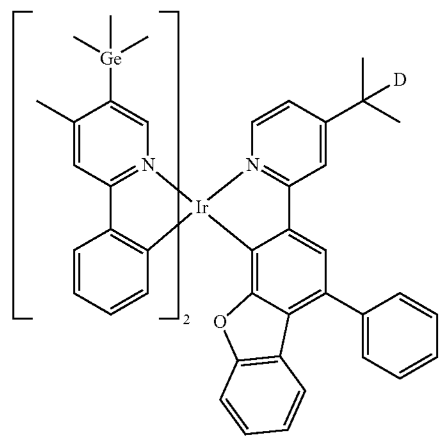
5134
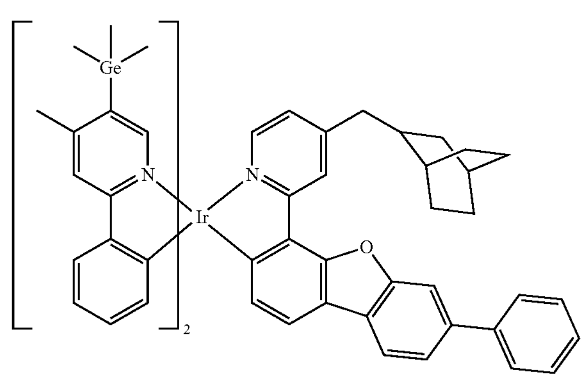

-continued
5135
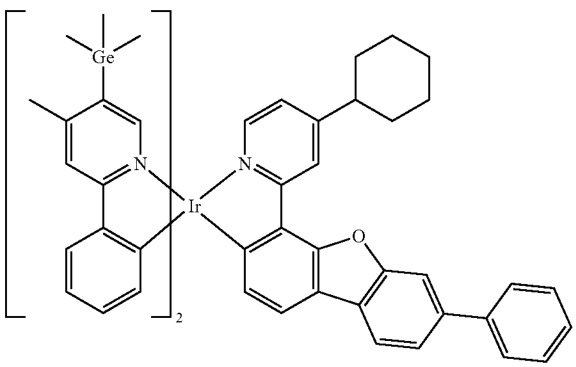
5136
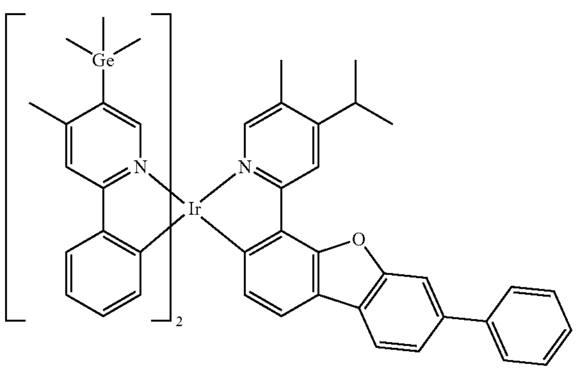
5137
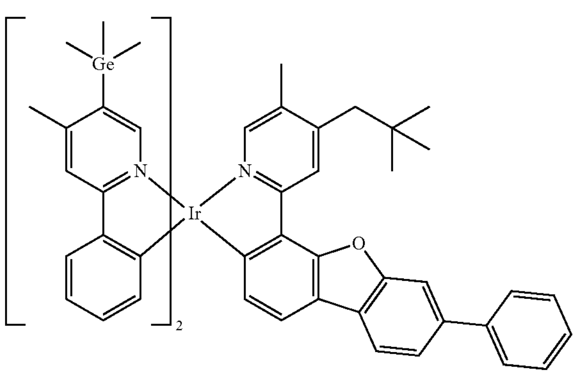
5138
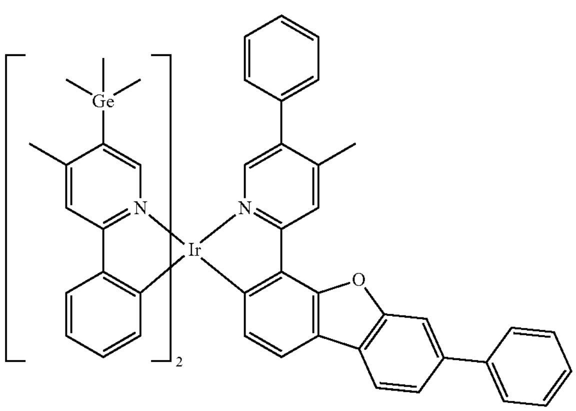
-continued
5139
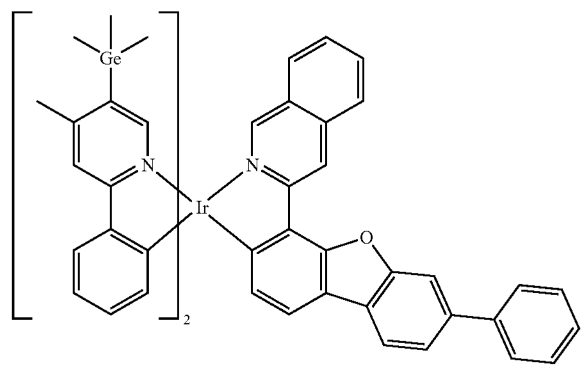
5140
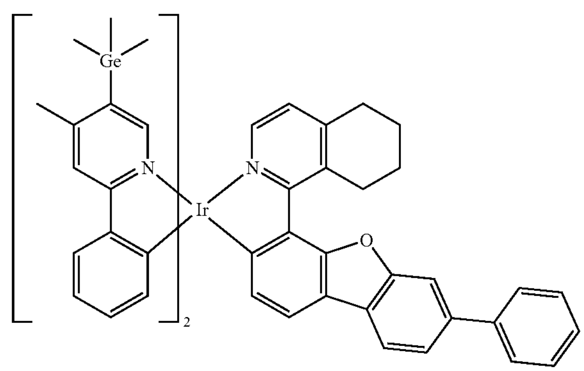
Group 1-7
D1
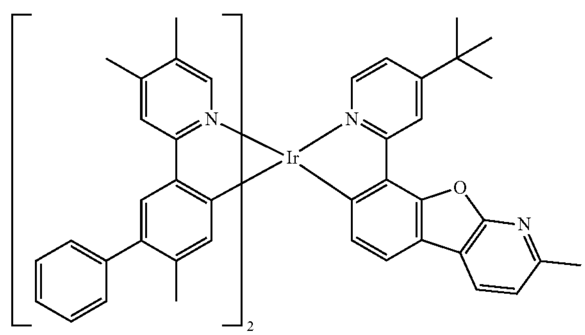
D2
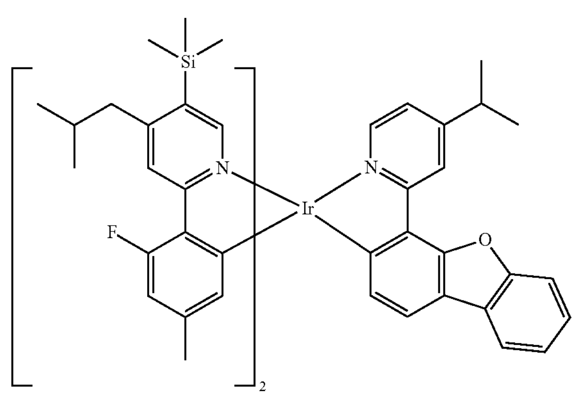

-continued

D3

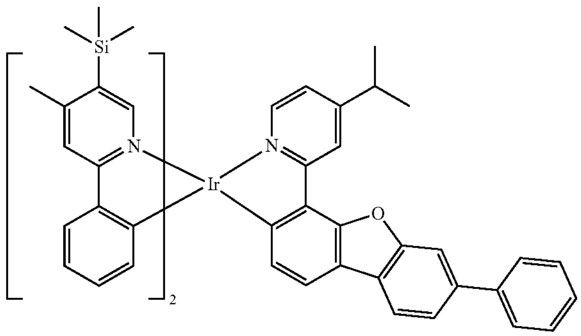

D4

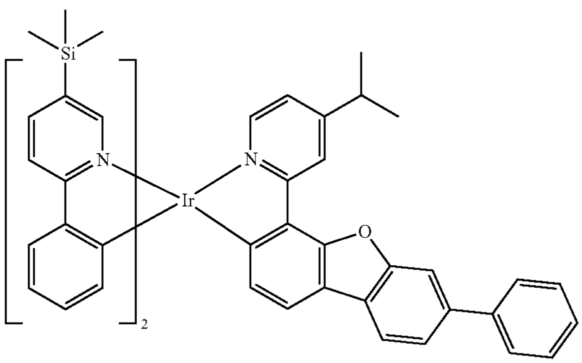

D5

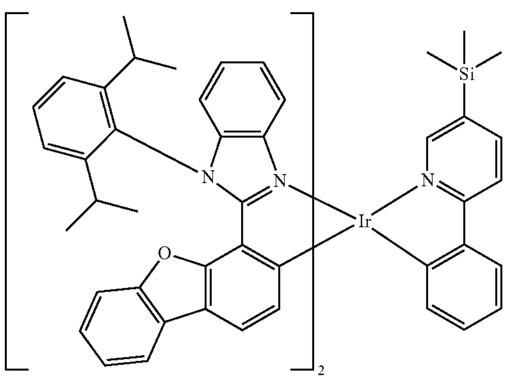

D6

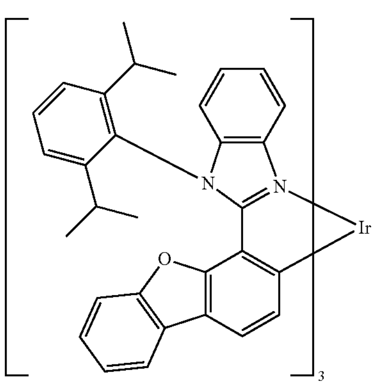

-continued

D7

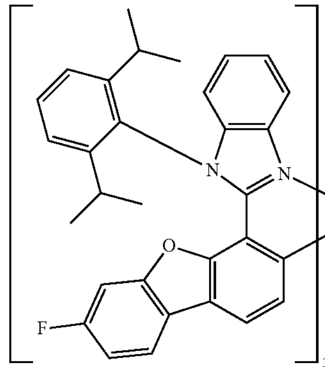

D8

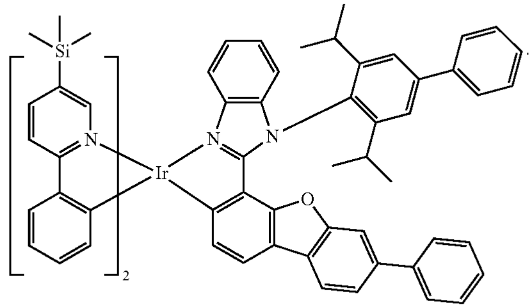

As used herein, "Ome" is a methoxy group, "TMS" is a trimethylsilyl group, and "TMG" is a trimethylgermyl group.

Meanwhile, the m2 hosts in the emission layer may each include a hole-transporting compound, an electron-transporting compound, a bipolar compound, or a combination thereof. Each of the m2 hosts may not include a transition metal.

For example, m2 may be 2, and the host may include a hole-transporting compound and an electron-transporting compound, and the hole-transporting compound and the electron-transporting compound may be different from each other.

In one or more embodiments, the hole-transporting compound may include at least one π electron-rich $C_3$-$C_{60}$ cyclic group, and may not include an electron-transporting group. Examples of the electron-transporting group include a cyano group, a fluoro group, a π-electron deficient nitrogen-containing cyclic group, a phosphine oxide group, a sulfoxide group, or the like.

The term "π-electron deficient nitrogen-containing cyclic group" used herein refers to a $C_1$-$C_{60}$ heterocyclic group having at least one *—N=*' moiety as a ring-forming moiety. Non-limiting examples of the r-electron deficient nitrogen-containing cyclic group may include a triazine group, an imidazole group, or the like.

The term "π electron-rich $C_3$-$C_{60}$ cyclic group" used herein may be a $C_3$-$C_{60}$ cyclic group that does not include a *—N=*' moiety as a ring-forming moiety. Non-limiting examples of the π electron-rich $C_3$-$C_{60}$ cyclic group may include a benzene group, a naphthalene group, a triphenylene group, a dibenzofuran group, a dibenzothiophene group, a carbazole group, an indolodibenzofuran group, an indolodibenzothiophene group, an indolocarbazole group, a naphthobenzofuran group, a naphthobenzothiophene group, a benzocarbazole group, a phenanthrobenzofuran group, a phenanthrobenzothiophene group, a naphthocarbazole group, a dinaphthofuran group, a dinaphthothiophene group, a dibenzocarbazole group, or the like.

For example, the hole-transporting compound may include two or more carbazole groups.

In one or more embodiments, the electron-transporting compound may be a compound including at least one electron-transporting group. The electron-transporting group may be a cyano group, a fluoro group, a π electron-deficient nitrogen-containing $C_1$-$C_{60}$ cyclic group, a phosphine oxide group, a sulfoxide group, or a combination thereof. In one or more embodiments, the electron-transporting compound may include a triazine group.

For example, the electron-transporting compound may include at least one electron-transporting group (for example, a triazine group or the like) and at least one rr electron-rich $C_3$-$C_{60}$ cyclic group (for example, a benzene group, a naphthalene group, a triphenylene group, a dibenzofuran group, a dibenzothiophene group, a carbazole group, an indolodibenzofuran group, an indolodibenzothiophene group, an indolocarbazole group, a naphthobenzofuran group, a naphthobenzothiophene group, a benzocarbazole group, a phenanthrobenzofuran group, a phenanthrobenzothiophene group, a naphthocarbazole group, a dinaphthofuran group, a dinaphthothiophene group, a dibenzocarbazole group, or the like, or a combination thereof).

In one or more embodiments, the hole-transporting compound may be a compound represented by Formula 6, but embodiments are not limited thereto:

Formula 6

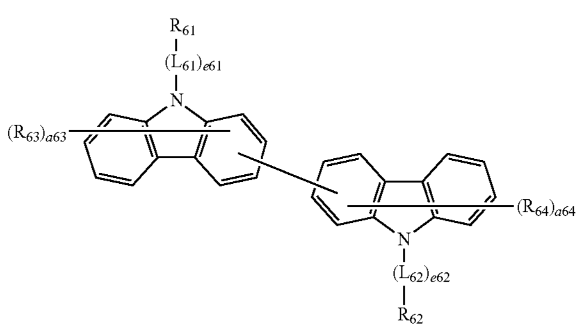

wherein, in Formula 6, $L_{61}$ and $L_{62}$ may each independently be a π electron-rich $C_3$-$C_{60}$ cyclic group (for example, a benzene group), unsubstituted or substituted with at least one of deuterium, a $C_1$-$C_{20}$ alkyl group, a deuterated $C_1$-$C_{20}$ alkyl group, a phenyl group, a deuterated phenyl group, a ($C_1$-$C_{20}$alkyl)phenyl group, a biphenyl group, a deuterated a biphenyl group, a ($C_1$-$C_{20}$alkyl)biphenyl group, —Si($Q_{33}$)($Q_{34}$)($Q_{35}$), or a combination thereof, e61 and e62 may each independently be an integer from 1 to 6, $R_{61}$ to $R_{64}$ may each independently be:

hydrogen, deuterium, a $C_1$-$C_{20}$ alkyl group, or a deuterated $C_1$-$C_{20}$ alkyl group;

a π electron-rich $C_3$-$C_{60}$ cyclic group (for example, a benzene group) unsubstituted or substituted with at least one of deuterium, a $C_1$-$C_{20}$ alkyl group, a deuterated $C_1$-$C_{20}$ alkyl group, a phenyl group, a deuterated phenyl group, a ($C_1$-$C_{20}$ alkyl)phenyl group, a biphenyl group, a deuterated biphenyl group, a ($C_1$-$C_{20}$ alkyl) biphenyl group, —Si($Q_{33}$)($Q_{34}$)($Q_{35}$), or a combination thereof; or Si($Q_3$)($Q_4$)($Q_5$).

a63 and a64 may each independently be an integer from 0 to 7.

$Q_3$ to $Q_5$ and $Q_{33}$ to $Q_{35}$ are each as described herein.

In one or more embodiments, the hole-transporting compound may be a compound represented by one of Formulae 6-1, 6-2, or 6-3, but embodiments are not limited thereto:

Formula 6-1

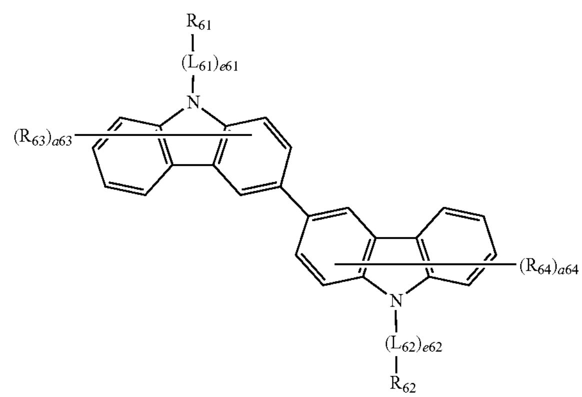

Formula 6-2

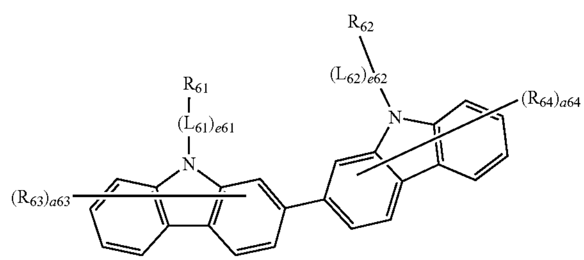

Formula 6-3

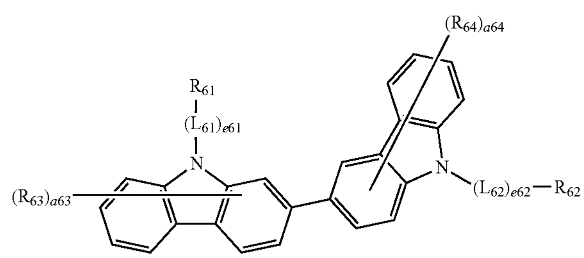

wherein, in Formulae 6-1 to 6-3, $L_{61}$, $L_{62}$, $R_{61}$ to $R_{64}$, e61, e62, a63, and a64 are respectively as those described herein.

In one or more embodiments, the hole-transporting compound may be one of compounds H-HT1 to H-HT4, but embodiments are not limited thereto:

H-HT1

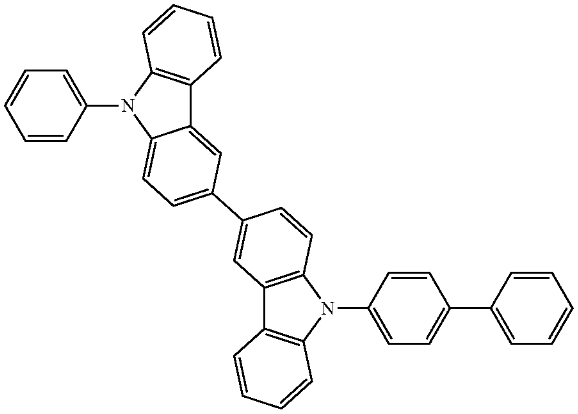

H-HT2

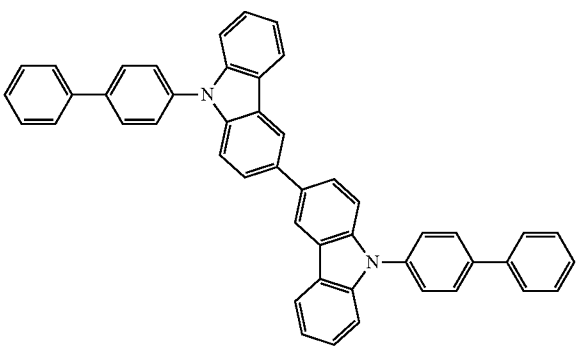

H-HT3

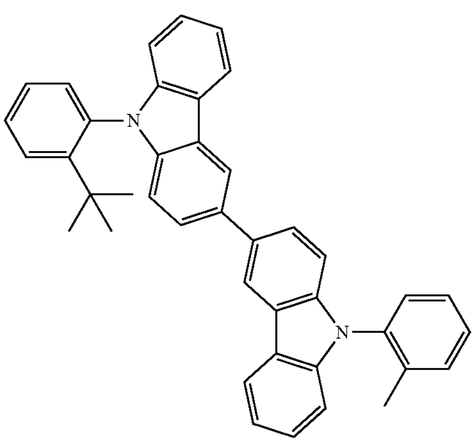

-continued

H-HT4

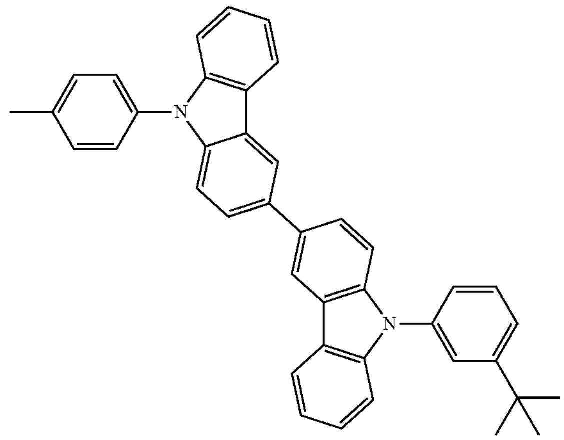

In one or more embodiments, the electron-transporting compound may be a compound represented by Formula 7:

Formula 7

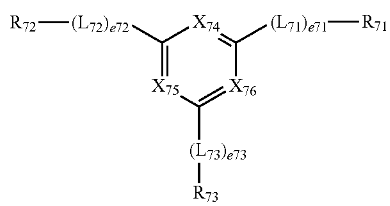

wherein, in Formula 7, $X_{74}$ may be $C(R_{74})$ or N, $X_{75}$ may be $C(R_{75})$ or N, $X_{76}$ may be $C(R_{76})$ or N, and at least one of $X_{74}$ to $X_{76}$ may be N, $L_{71}$ to $L_{73}$ may each independently be a $C_5$-$C_{30}$ carbocyclic group or a $C_1$-$C_{30}$ heterocyclic group, each unsubstituted or substituted with at least one of deuterium, —F, a cyano group, a $C_1$-$C_{20}$ alkyl group, a deuterated $C_1$-$C_{20}$ alkyl group, a fluorinated $C_1$-$C_{20}$ alkyl group, a phenyl group, a deuterated phenyl group, a fluorinated phenyl group, a ($C_1$-$C_{20}$ alkyl)phenyl group, a biphenyl group, a deuterated biphenyl group, a fluorinated biphenyl group, a ($C_1$-$C_{20}$ alkyl)biphenyl group, —$Si(Q_{33})(Q_{34})(Q_{35})$, or a combination thereof, e71 to e73 may each independently be an integer from 1 to 10, $R_{71}$ to $R_{76}$ may each independently be:

hydrogen, deuterium, —F, or a cyano group;

a $C_1$-$C_{20}$ alkyl group, unsubstituted or substituted with at least one of deuterium, —F, a cyano group, or a combination thereof;

a $C_5$-$C_{30}$ carbocyclic group or a $C_1$-$C_{30}$ heterocyclic group, each unsubstituted or substituted with at least one of deuterium, —F, a cyano group, a $C_1$-$C_{20}$ alkyl group, a deuterated $C_1$-$C_{20}$ alkyl group, a fluorinated $C_1$-$C_{20}$ alkyl group, a phenyl group, a deuterated phenyl group, a fluorinated phenyl group, a ($C_1$-$C_{20}$ alkyl) phenyl group, a biphenyl group, a deuterated biphenyl group, a fluorinated biphenyl group, a ($C_1$-$C_{20}$ alkyl) biphenyl group, a —$Si(Q_{33})(Q_{34})(Q_{35})$, or a combination thereof; or $Si(Q_3)(Q_4)(Q_5)$.

$Q_3$ to $Q_5$ and $Q_{33}$ to $Q_{35}$ are each as described herein.

In one or more embodiments, each of $X_{74}$ to $X_{76}$ in Formula 7 may be N.

In one or more embodiments, $L_{71}$ to $L_{73}$ in Formula 7 may each independently be a benzene group, a naphthalene group, a triphenylene group, a dibenzofuran group, a dibenzothiophene group, a carbazole group, an indolodibenzofuran group, an indolodibenzothiophene group, an indolocarbazole group, a naphthobenzofuran group, a naphthobenzothiophene group, a benzocarbazole group, a phenanthrobenzofuran group, a phenanthrobenzothiophene group, a naphthocarbazole group, a dinaphthofuran group, a dinaphthothiophene group, or a dibenzocarbazole group, each unsubstituted or substituted with at least one of deuterium, —F, a cyano group, a $C_1$-$C_{20}$ alkyl group, a deuterated $C_1$-$C_{20}$ alkyl group, a fluorinated $C_1$-$C_{20}$ alkyl group, a phenyl group, a deuterated phenyl group, a fluorinated phenyl group, a ($C_1$-$C_{20}$ alkyl)phenyl group, a biphenyl group, a deuterated a biphenyl group, a fluorinated biphenyl group, a ($C_1$-$C_{20}$ alkyl)biphenyl group, —Si($Q_{33}$)($Q_{34}$)($Q_{35}$), or a combination thereof.

In one or more embodiments, in Formula 7, at least one of e71 $L_{71}$, at least one of e72 $L_{72}$, at least one of e73 $L_{73}$, or a combination thereof may each independently be a dibenzofuran group, a dibenzothiophene group, a carbazole group, an indolodibenzofuran group, an indolodibenzothiophene group, an indolocarbazole group, a naphthobenzofuran group, a naphthobenzothiophene group, a benzocarbazole group, a phenanthrobenzofuran group, a phenanthrobenzothiophene group, a naphthocarbazole group, a dinaphthofuran group, a dinaphthothiophene group, or a dibenzocarbazole group, each unsubstituted or substituted with at least one of deuterium, —F, a cyano group, a $C_1$-$C_{20}$ alkyl group, a deuterated $C_1$-$C_{20}$ alkyl group, a fluorinated $C_1$-$C_{20}$ alkyl group, a phenyl group, a deuterated phenyl group, a fluorinated phenyl group, a ($C_1$-$C_{20}$ alkyl) phenyl group, a biphenyl group, a deuterated biphenyl group, a fluorinated biphenyl group, a ($C_1$-$C_{20}$ alkyl)biphenyl group, a —Si($Q_{33}$)($Q_{34}$)($Q_{35}$), or a combination thereof.

In one or more embodiments, in Formula 7, at least one of e71 $L_{71}$, at least one of e72 $L_{72}$, at least one of e73 $L_{73}$, or a combination thereof includes a carbazole group, a indolocarbazole group, a benzocarbazole group, a naphthocarbazole group, or a dibenzocarbazole group, wherein a nitrogen atom of a pyrrole group in the carbazole group, the indolocarbazole group, the benzocarbazole group, the naphthocarbazole group, or the dibenzocarbazole group may be linked to the carbon atom of the 6-membered ring including $X_{74}$ to $X_{76}$ in Formula 7, with a single bond or neighboring $L_{71}$, $L_{72}$ and/or $L_{73}$ therebetween.

In one or more embodiments, e71 to e73 in Formula 7 each indicate the numbers of $L_{71}$ to $L_{73}$, respectively, and may each independently be, for example, 1, 2, 3, 4, or 5.

In one or more embodiments, $R_{71}$ to $R_{76}$ in Formula 7 may each independently be:

hydrogen, deuterium, —F, or a cyano group;

a $C_1$-$C_{20}$ alkyl group, unsubstituted or substituted with at least one of deuterium, —F, a cyano group, or a combination thereof;

a benzene group, a naphthalene group, a triphenylene group, a dibenzofuran group, a dibenzothiophene group, a carbazole group, an indolodibenzofuran group, an indolodibenzothiophene group, an indolocarbazole group, a naphthobenzofuran group, a naphthobenzothiophene group, a benzocarbazole group, a phenanthrobenzofuran group, a phenanthrobenzothiophene group, a naphthocarbazole group, a dinaphthofuran group, a dinaphthothiophene group, or a dibenzocarbazole group, each unsubstituted or substituted with at least one of deuterium, —F, a cyano group, a $C_1$-$C_{20}$ alkyl group, a deuterated $C_1$-$C_{20}$ alkyl group, a fluorinated $C_1$-$C_{20}$ alkyl group, a phenyl group, a deuterated phenyl group, a fluorinated phenyl group, a ($C_1$-$C_{20}$ alkyl)phenyl group, a biphenyl group, a deuterated biphenyl group, a fluorinated biphenyl group, a ($C_1$-$C_{20}$ alkyl)biphenyl group, —Si($Q_{33}$)($Q_{34}$)($Q_{35}$), or a combination thereof; or Si($Q_3$)($Q_4$)($Q_5$).

In one or more embodiments, the electron-transporting compound may be one of Compounds H-ET1 to H-ET5, but embodiments are not limited thereto:

H-ET1

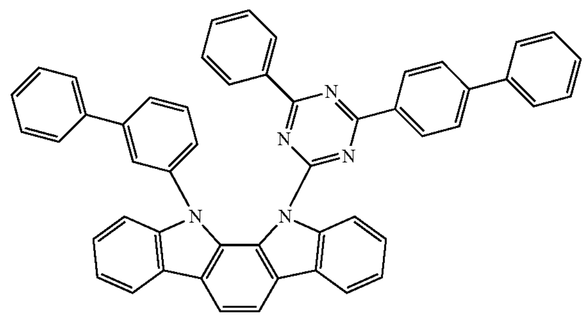

H-ET2

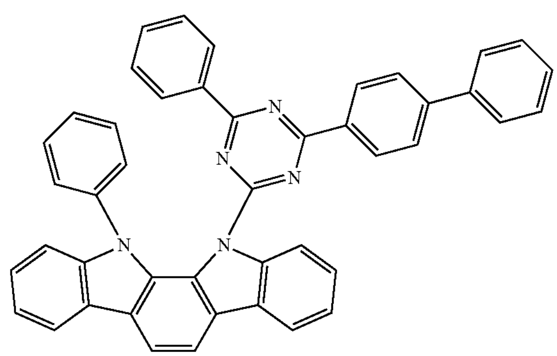

H-ET3

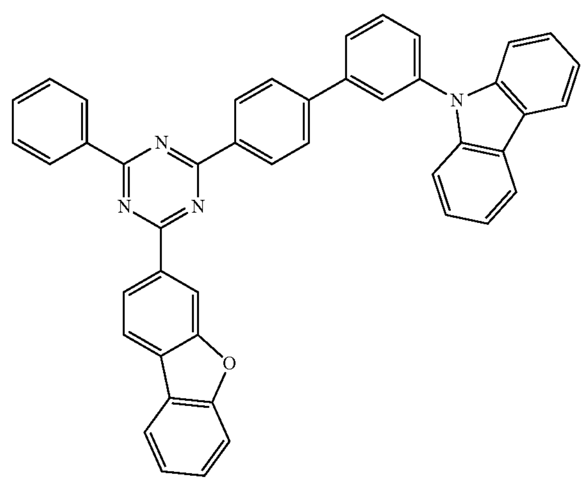

-continued

H-ET4

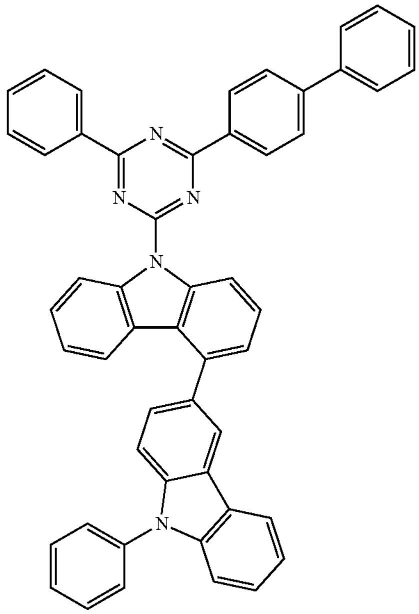

H-ET5

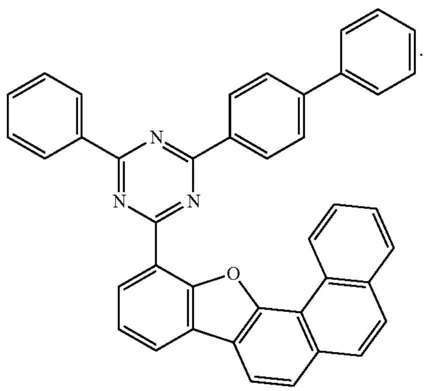

According to another aspect, the light-emitting device may be included in an electronic apparatus. Thus, an electronic apparatus including the light-emitting device is also provided. The electronic apparatus may include, for example, a display, an illumination, a sensor, or the like, but embodiments are not limited thereto.

Description of FIG. 1

FIG. 1 schematically illustrates a cross-sectional view of an organic light-emitting device 10, which is a light-emitting device according to one or more embodiments. Hereinafter, the structure and manufacturing method of the organic light-emitting device 10 according to one or more embodiments will be described in further detail in connection with FIG. 1.

The organic light-emitting device 10 of FIG. 1 includes a first electrode 11, a second electrode 19, and an interlayer 15 located between the first electrode 11 and the second electrode 19. The interlayer 15 may include a hole transport region, an emission layer, and an electron transport region.

A substrate may be additionally disposed under the first electrode 11 or on the second electrode 19. The substrate may be a conventional substrate used in organic light-emitting devices, e.g., a glass substrate or a transparent plastic substrate, each having excellent mechanical strength, thermal stability, transparency, surface smoothness, ease of handling, and/or water repellency.

The first electrode 11 may be produced by depositing or sputtering, onto the substrate, a material for forming the first electrode 11. The first electrode 11 may be an anode. The material for forming the first electrode 11 may include materials with a high work function to facilitate hole injection. The first electrode 11 may be a reflective electrode. The material for forming the first electrode 11 may be indium tin oxide (ITO), indium zinc oxide (IZO), tin oxide ($SnO_2$), or zinc oxide (ZnO). In one or more embodiments, the material for forming the first electrode 11 may be metal, such as magnesium (Mg), aluminum (Al), silver (Ag), aluminum-lithium (Al—Li), calcium (Ca), magnesium-indium (Mg—In), or magnesium-silver (Mg—Ag).

The first electrode 11 may have a single-layered structure or a multi-layered structure including a plurality of layers. For example, the first electrode 11 may have a three-layered structure of ITO/Ag/ITO.

The hole transport region may be located between the first electrode 11 and the emission layer.

The hole transport region may include a hole injection layer, a hole transport layer, an electron blocking layer, a buffer layer, or a combination thereof.

The hole transport region may include only either a hole injection layer or a hole transport layer. In one or more embodiments, the hole transport region may have a hole injection layer/hole transport layer structure or a hole injection layer/hole transport layer/electron blocking layer structure, wherein, for each structure, respective layers are sequentially stacked in this stated order from the first electrode 11.

When the hole-transporting region includes a hole injection layer, the hole injection layer may be formed on the first electrode 11 by using various methods such as a vacuum deposition method, spin coating, casting, a Langmuir-Blodgett (LB) method, inkjet printing, or the like.

When a hole injection layer is formed by vacuum deposition, the deposition conditions may vary depending on a material that is used to form the hole injection layer, and the structure and thermal characteristics of the hole injection layer. For example, the deposition conditions may include a deposition temperature of about 100° C. to about 500° C., a vacuum pressure of about $10^{-8}$ torr to about $10^{-3}$ torr, and a deposition rate of about 0.01 angstroms per second (Å/sec) to about 100 Å/sec.

When the hole injection layer is formed by spin coating, the coating conditions may vary depending on a material for forming the hole injection layer, and the structure and thermal characteristics of the hole injection layer. For example, the coating conditions may include a coating speed in a range of about 2,000 revolutions per minute (rpm) to about 5,000 rpm and a heat treatment temperature of about 80° C. to about 200° C. for removing a solvent after coating.

The conditions for forming the hole transport layer and the electron blocking layer may be the same as or similar to the conditions for forming the hole injection layer.

The hole transport region may include at least one of 4,4',4"-tris(3-methylphenylphenylamino)triphenylamine (m-MTDATA), 4,4',4"-tris(N,N-diphenylamino)triphenylamine (TDATA), 4,4',4"-tris{N-(2-naphthyl)-N-phenylamino}-triphenylamine (2-TNATA), N,N'-di(1-naphthyl)-N,N'-diphenylbenzidine (NPB), β-NPB, N,N'-bis(3-methylphenyl)-N,N'-diphenyl-[1,1-biphenyl]-4,4'diamine (TPD), spiro-TPD, spiro-NPB, methylated NPB, 4,4'-cyclohexylidene bis[N,N-bis(4-methylphenyl)benzenamine] (TAPC), 4,4'-bis[N,N'-(3-tolyl)amino]-3,3'-dimethylbiphenyl (HMTPD), 4,4',4"-tris(N-carbazolyl)triphenylamine (TCTA), polyaniline/dodecylbenzenesulfonic acid (PANI/

DBSA), poly(3,4-ethylenedioxythiophene)/poly(4-styrenesulfonate) (PEDOT/PSS), polyaniline/camphor sulfonic acid (PANI/CSA), polyaniline/poly(4-styrenesulfonate) (PANI/PSS), a compound represented by Formula 201, a compound represented by Formula 202, or a combination thereof, but embodiments are not limited thereto:
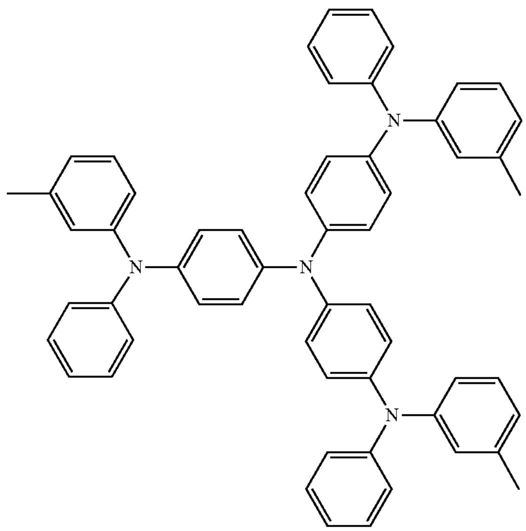
m-MTDATA
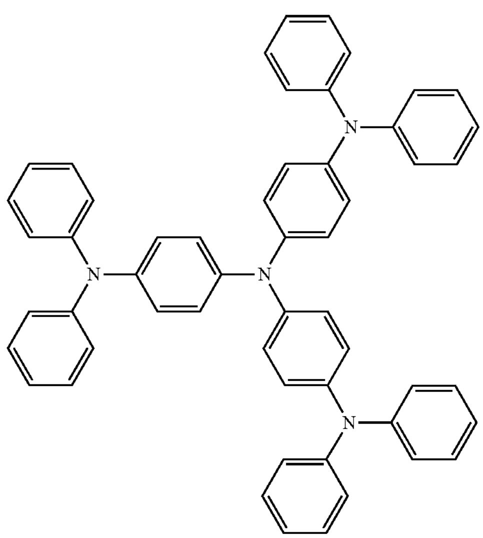
TDATA
-continued
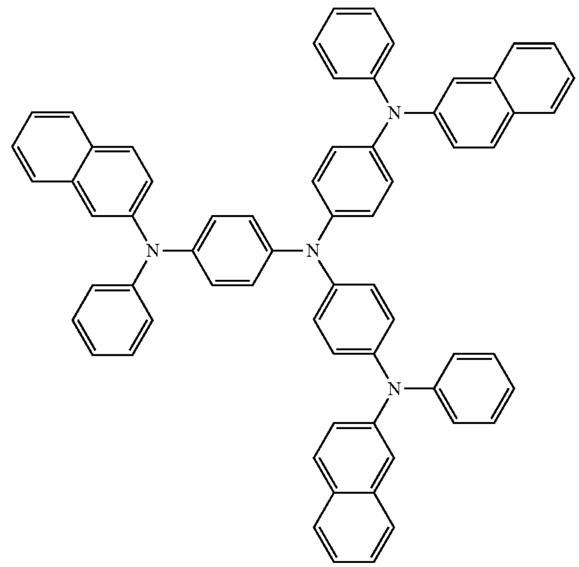
2-TNATA
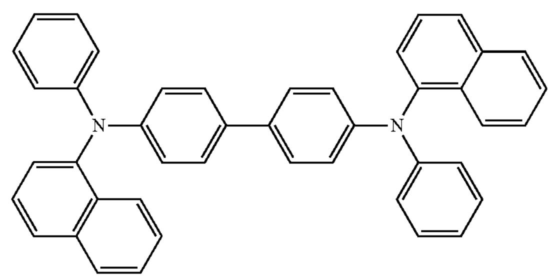
NPB
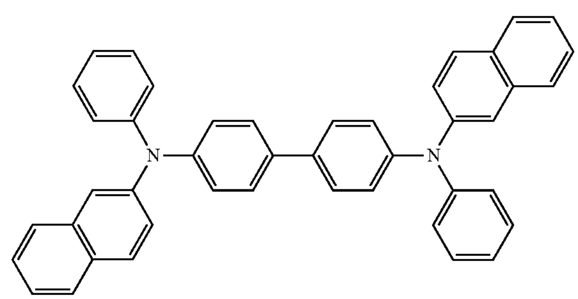
β-NPB
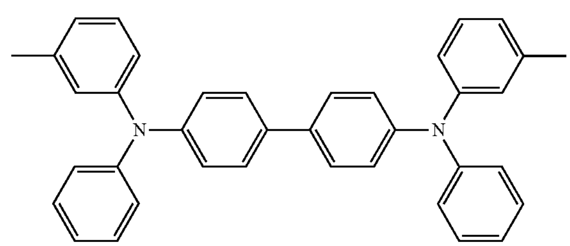
TPD -continued

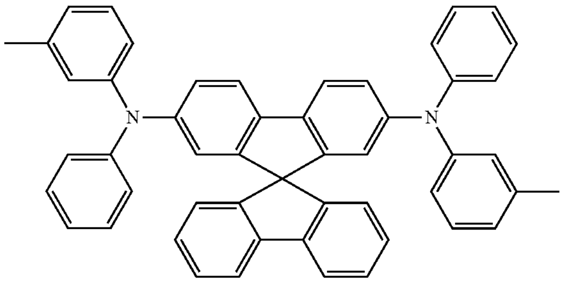

Spiro-TPD

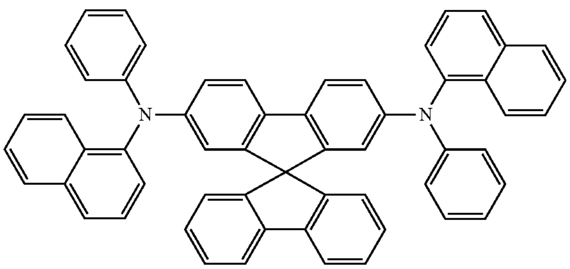

Spiro-NPB

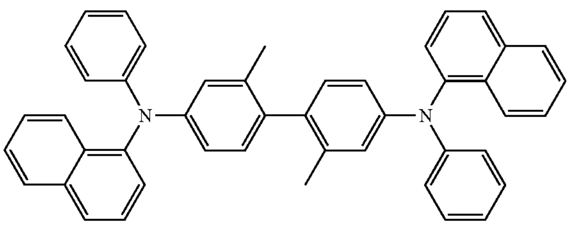

methylated NPB

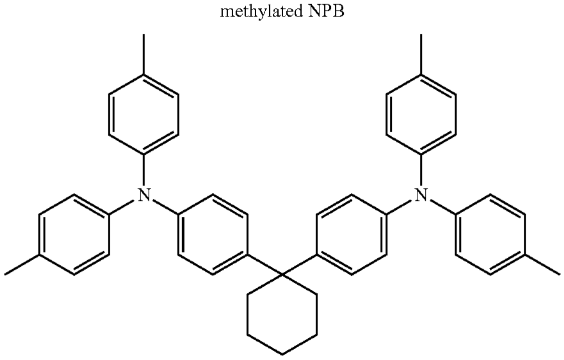

TAPC

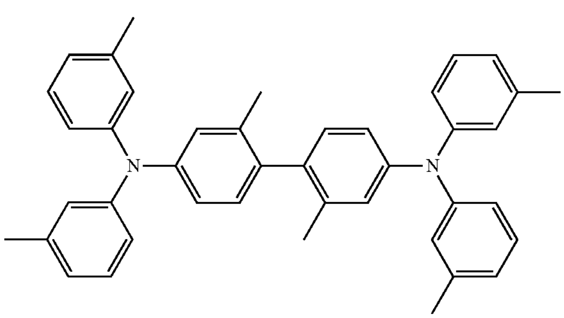

HMTPD

-continued

Formula 201

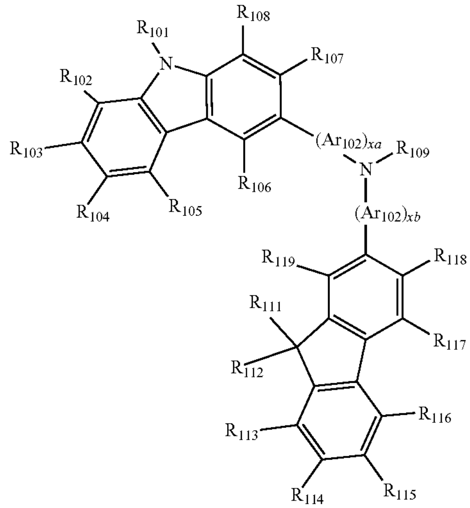

Formula 202

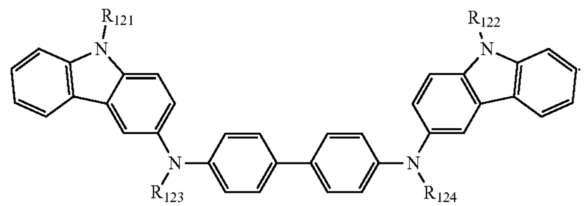

In Formula 201, $Ar_{101}$ and $Ar_{102}$ may each independently be a phenylene group, a pentalenylene group, an indenylene group, a naphthylene group, an azulenylene group, a heptalenylene group, an acenaphthylene group, a fluorenylene group, a phenalenylene group, a phenanthrenylene group, an anthracenylene group, a fluoranthenylene group, a triphenylenylene group, a pyrenylene group, a chrysenylenylene group, a naphthacenylene group, a picenylene group, a perylenylene group, or a pentacenylene group, each unsubstituted or substituted with at least one of deuterium, —F, —Cl, —Br, —I, $—SF_5$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_1$-$C_{60}$ alkylthio group, a $C_3$-$C_{10}$ cycloalkyl group, a $C_3$-$C_{10}$ cycloalkenyl group, a $C_1$-$C_{10}$ heterocycloalkyl group, a $C_1$-$C_{10}$ heterocycloalkenyl group, a $C_6$-$C_{60}$ aryl group, a $C_7$-$C_{60}$ alkyl aryl group, a $C_7$-$C_{60}$ aryl alkyl group, a $C_6$-$C_{60}$ aryloxy group, a $C_6$-$C_{60}$ arylthio group, a $C_1$-$C_{60}$ heteroaryl group, a $C_2$-$C_{60}$ alkyl heteroaryl group, a $C_2$-$C_{60}$ heteroaryl alkyl group, a $C_1$-$C_{60}$ heteroaryloxy group, a $C_1$-$C_{60}$ heteroarylthio group, a monovalent non-aromatic condensed polycyclic group, a monovalent non-aromatic condensed heteropolycyclic group, or a combination thereof.

xa and xb in Formula 201 may each independently be an integer from 0 to 5, or 0, 1, or 2. For example, xa may be 1 and xb may be 0.

$R_{101}$ to $R_{108}$, $R_{111}$ to $R_{119}$ and $R_{121}$ to $R_{124}$ in Formulae 201 and 202 may each independently be:

hydrogen, deuterium, —F, —Cl, —Br, —I, $—SF_5$, a hydroxyl group, a cyano group, a nitro group, an amino group, a $C_1$-$C_{10}$ alkyl group (for example, a methyl group, an ethyl group, a propyl group, a butyl group, a pentyl group, a hexyl group, or the like), a $C_1$-$C_{10}$ alkoxy group (for example, a methoxy group, an ethoxy group, a propoxy group, a butoxy group, a pentoxy group, or the like), or a $C_1$-$C_{10}$ alkylthio group;

a $C_1$-$C_{10}$ alkyl group, a $C_1$-$C_{10}$ alkoxy group, a $C_1$-$C_{10}$ alkylthio group, each unsubstituted or substituted with at least one of deuterium, —F, —Cl, —Br, —I, —$SF_5$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, or a combination thereof; or a phenyl group, a naphthyl group, an anthracenyl group, a fluorenyl group, or a pyrenyl group, each unsubstituted or substituted with at least one of deuterium, —F, —Cl, —Br, —I, —$SF_5$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{10}$ alkyl group, a $C_1$-$C_{10}$ alkoxy group, a $C_1$-$C_{10}$ alkylthio group, or a combination thereof.

In Formula 201, $R_{109}$ may be a phenyl group, a naphthyl group, an anthracenyl group, or a pyridinyl group, each unsubstituted or substituted with at least one of deuterium, —F, —Cl, —Br, —I, —$SF_5$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a $C_1$-$C_{10}$ alkylthio group, a phenyl group, a naphthyl group, an anthracenyl group, a pyridinyl group, or a combination thereof.

In one embodiment, the compound represented by Formula 201 may be represented by Formula 201A, but embodiments are not limited thereto:

Formula 201A

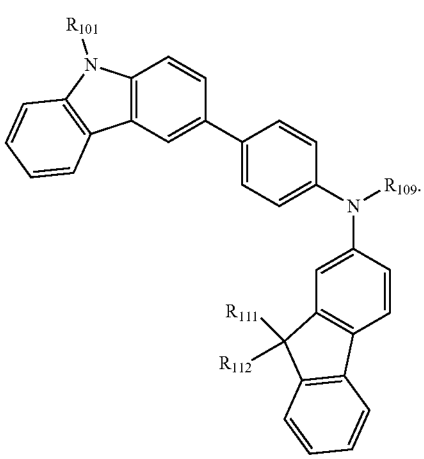

$R_{101}$, $R_{111}$, $R_{112}$, and $R_{109}$ in Formula 201A are each as described herein.

For example, the hole transport region may include at least one of Compounds HT1 to HT20, or a combination thereof, but embodiments are not limited thereto:

HT1

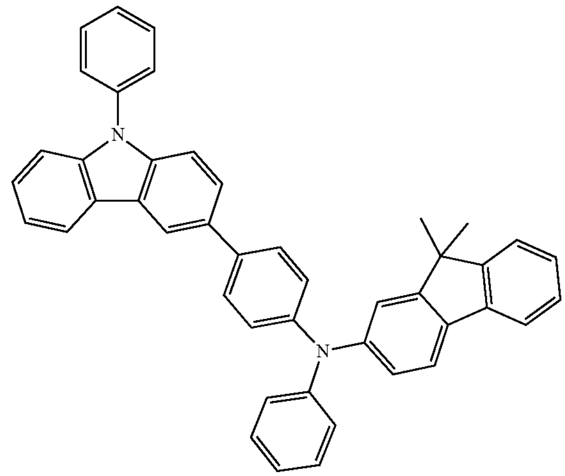

HT2

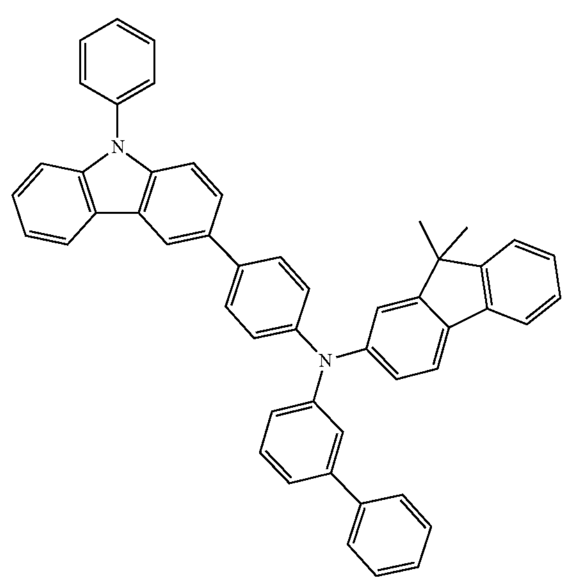

-continued
HT3
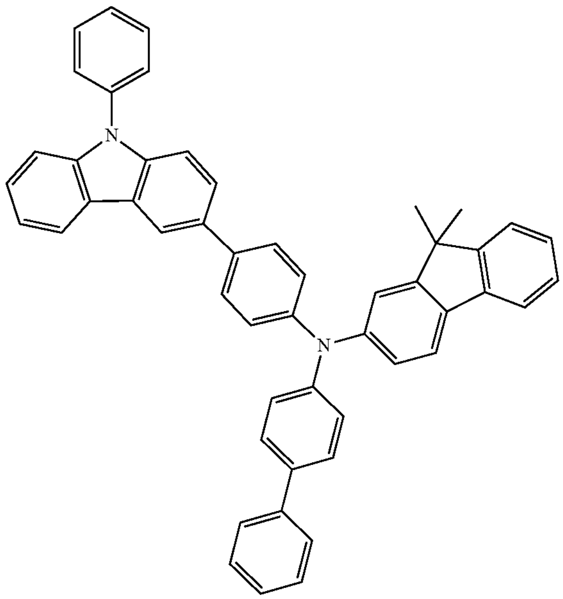
HT4
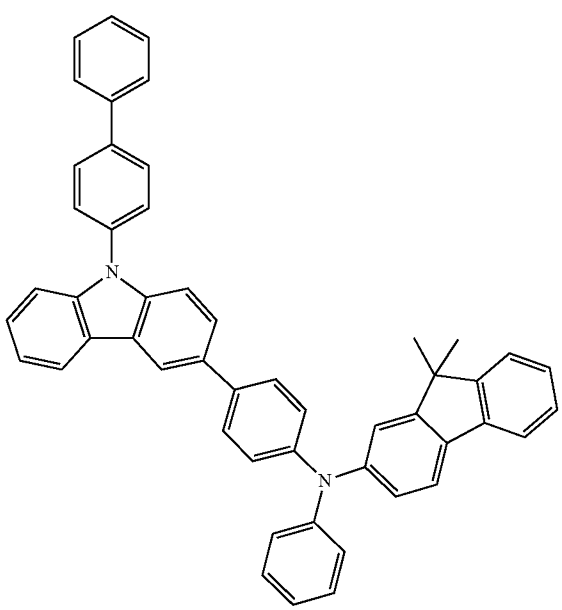
-continued
HT5
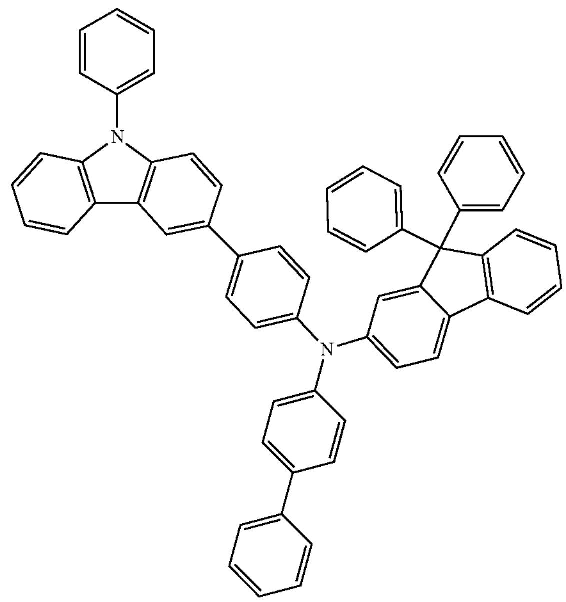
HT6
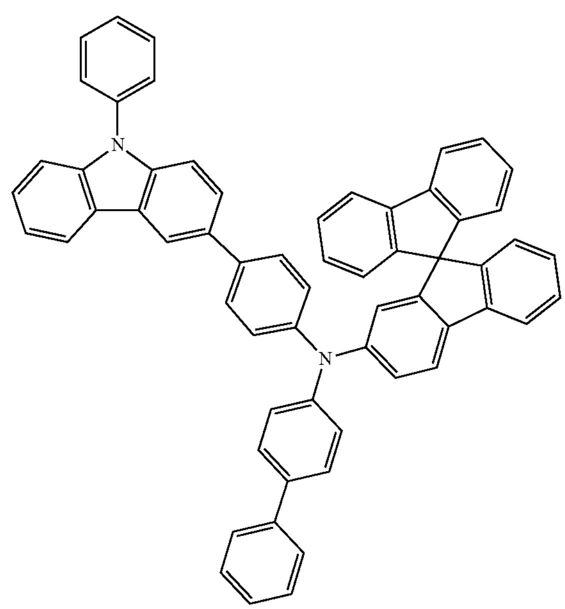

-continued
HT7
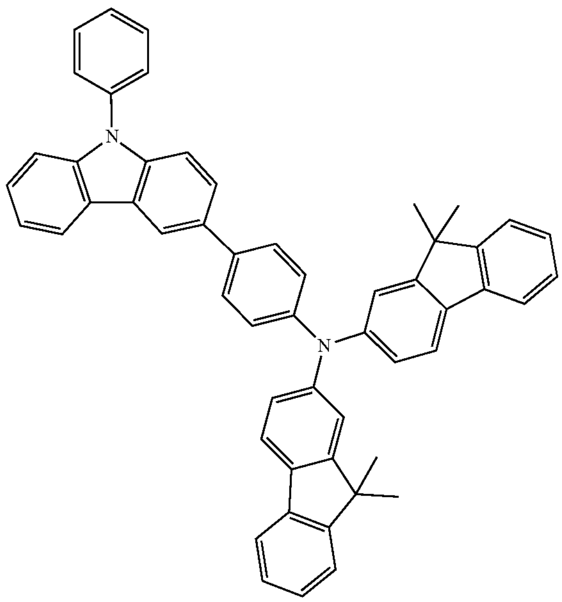
HT8
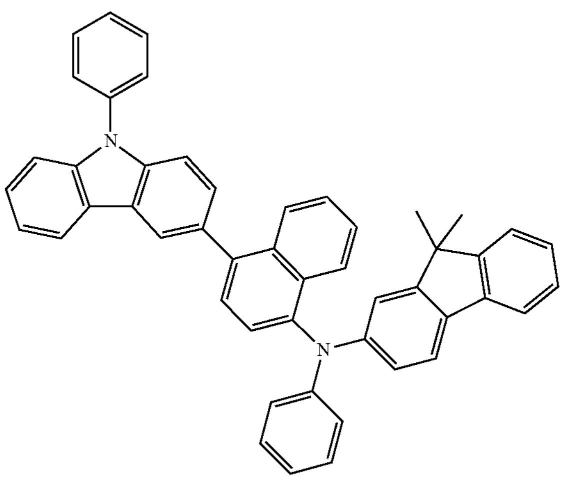
HT9
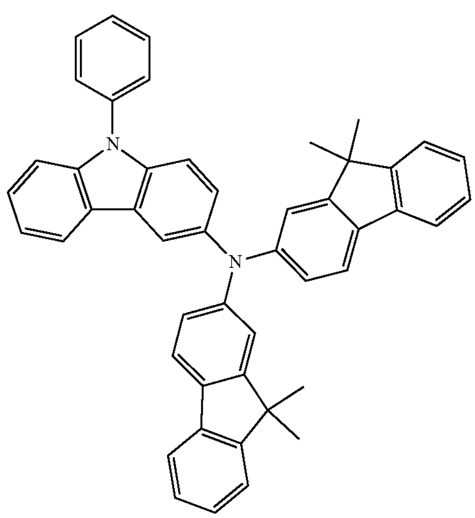
-continued
HT10
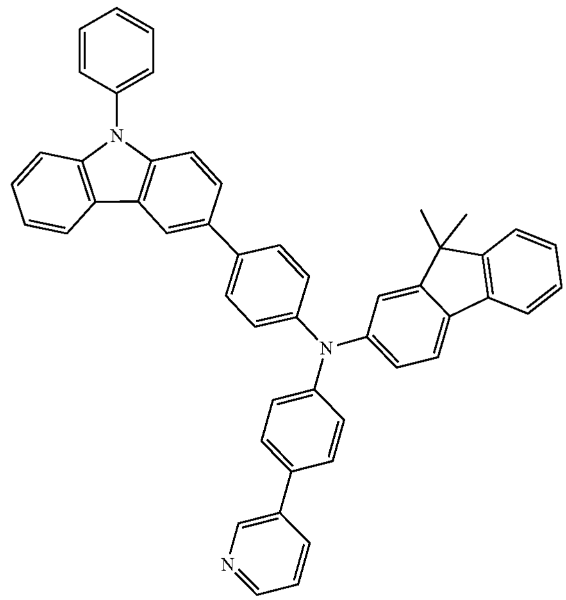
HT11
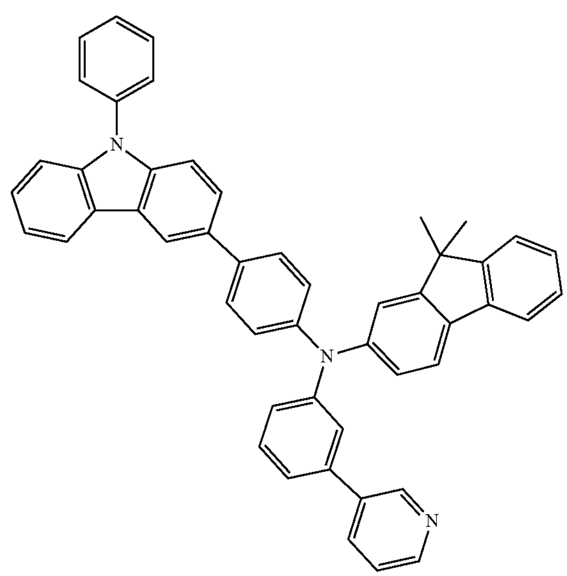

-continued
HT12
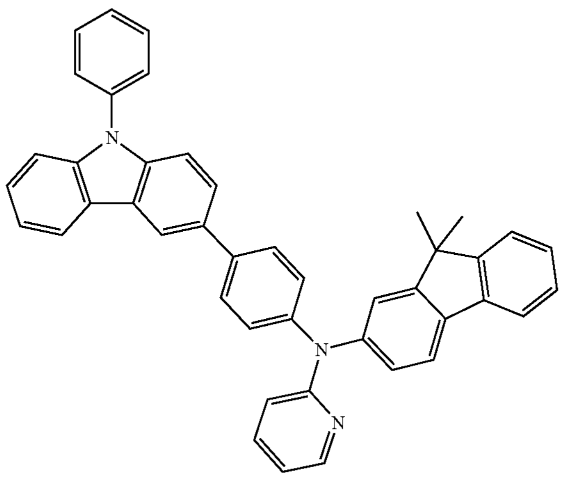
HT13
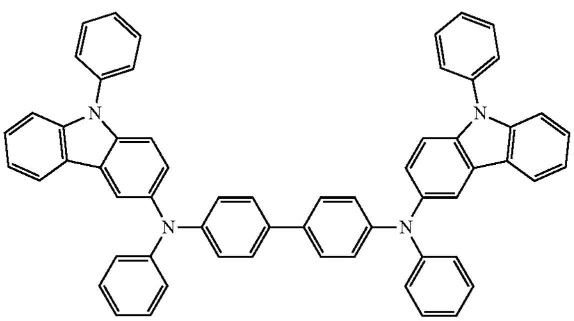
HT14
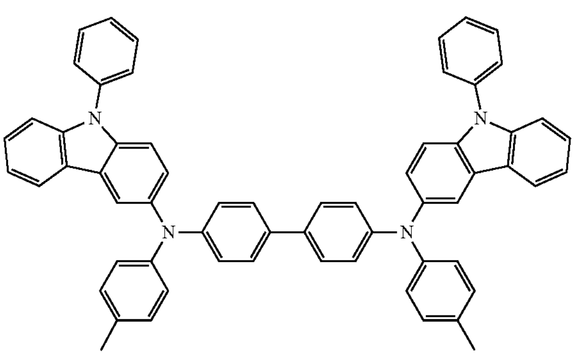
HT15
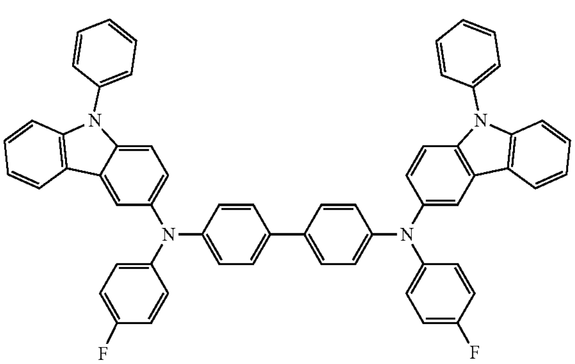
-continued
HT16
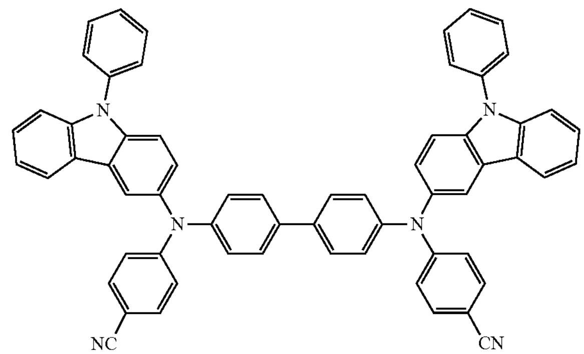
HT17
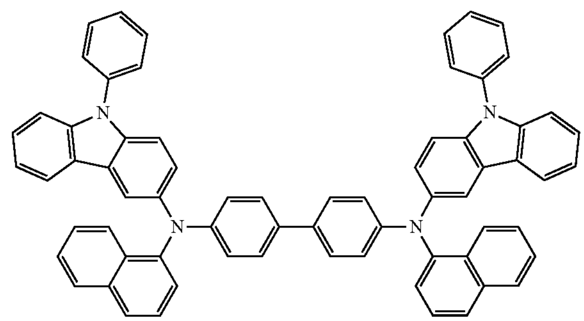
HT18
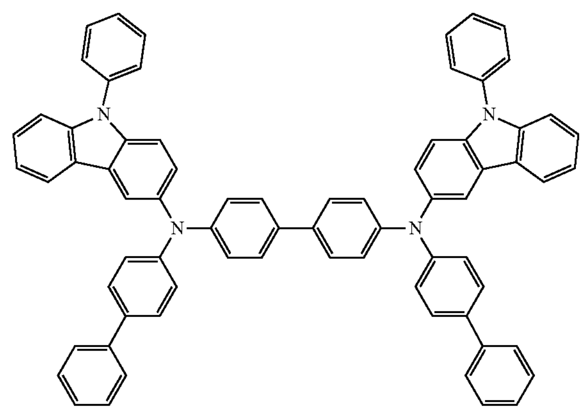
HT19
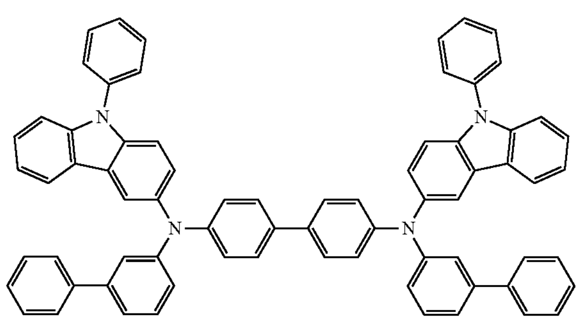

-continued

HT20

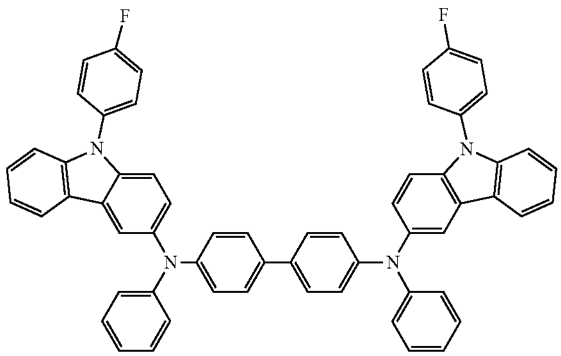

The thickness of the hole transport region may be about 100 Å to about 10000 Å, for example, about 100 Å to about 5000 Å. When the hole transport region includes a hole injection layer, a hole transport layer, an electron-blocking layer, or a combination thereof, the thickness of the hole injection layer may be about 100 Å to about 10000 Å, for example, about 100 Å to about 2000 Å, and the thickness of the hole transport layer may be about 50 Å to about 2000 Å, for example, about 100 Å to about 1500 Å. When the thickness of the hole injection layer and the hole transport layer of the hole transport region satisfies these ranges, satisfactory hole transport characteristics may be obtained without a substantial increase in driving voltage.

The hole transport region may further include, in addition to these materials, a charge-generation material for the improvement of conductive properties. The charge-generation material may be homogeneously or non-homogeneously dispersed in the hole transport region.

The charge-generation material may be, for example, a p-dopant. The p-dopant may be a quinone derivative, a metal oxide, a cyano group-containing compound, or a combination thereof. For example, the p-dopant may include at least one of a quinone derivative such as tetracyanoquinodimethane (TCNQ), 2,3,5,6-tetrafluoro-tetracyano-1,4-benzoquinonedimethane (F4-TCNQ), 1,3,4,5,7,8-hexafluorotetracyanonaphthoquinodimethane (F6-TCNNQ), or the like; a metal oxide, such as a tungsten oxide, a molybdenum oxide, or the like; a cyano group-containing compound, such as Compound HT-D1 or the like; or a combination thereof, but embodiments are not limited thereto:

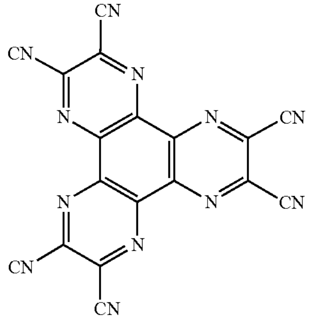

HT-D1

-continued

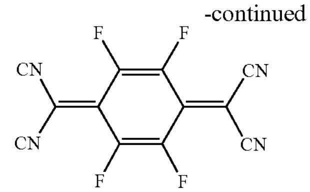

F4-TCNQ

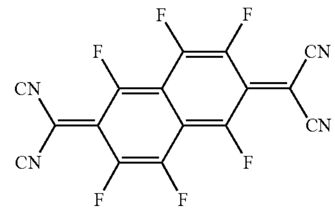

F6-TCNNQ

The hole transport region may include a buffer layer.

Also, the buffer layer may compensate for an optical resonance distance according to a wavelength of light emitted from the emission layer, and thus, efficiency of a formed organic light-emitting device may be improved.

Meanwhile, when the hole transport region includes an electron-blocking layer, a material for the electron-blocking layer may include a material that can be used in the hole transport region as described above, a host material, or a combination thereof. For example, when the hole transport region includes an electron-blocking layer, H-HT2, or the like may be used as a material for the electron-blocking layer.

An emission layer may be formed on the hole transport region by using a method such as a vacuum deposition method, a spin coating method, casting, an LB method, and/or inkjet printing. When the emission layer is formed by vacuum deposition or spin coating, the deposition or coating conditions may be similar to those applied in forming the hole injection layer although the deposition or coating conditions may vary according to a material that is used to form the emission layer.

The emission layer may include the composition as described herein.

A thickness of the emission layer may be about 100 Å to about 1,000 Å, for example, about 200 Å to about 600 Å, about 200 Å to about 500 Å, about 300 Å to about 500 Å, or about 200 Å to about 400 Å. When the thickness of the emission layer is within these ranges, excellent light-emission characteristics may be obtained without a substantial increase in driving voltage.

An electron transport region may be located on the emission layer.

The electron transport region may include a hole blocking layer, an electron transport layer, an electron injection layer, or a combination thereof.

For example, the electron transport region may have a hole blocking layer/electron transport layer/electron injection layer structure, or an electron transport layer/electron injection layer structure. The electron transport layer may have a single-layered structure or a multi-layered structure including two or more different materials.

Conditions for forming the hole blocking layer, the electron transport layer, and the electron injection layer which constitute the electron transport region may be understood by referring to the conditions for forming the hole injection layer.

When the electron transport region includes a hole blocking layer, the hole blocking layer may include, for example, at least one of 2,9-dimethyl-4,7-diphenyl-1,10-phenanthroline (BCP), 4,7-diphenyl-1,10-phenanthroline (Bphen), bis(2-methyl-8-quinolinolato-N1,O8)-(1,1'-biphenyl-4-olato) aluminum (BAlq), or a combination thereof, but embodiments are not limited thereto:

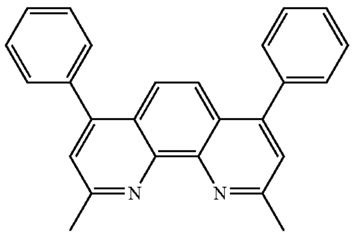

BCP

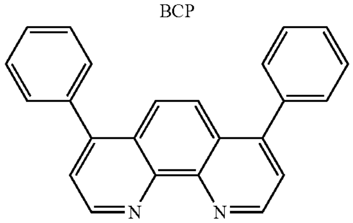

Bphen

In one or more embodiments, the hole-blocking layer may include any host material a material for an electron-transporting layer, a material for an electron injection layer, or a combination thereof, which will be described later.

A thickness of the hole blocking layer may be in a range of about 20 Å to about 1,000 Å, for example, about 30 Å to about 600 Å. When the thickness of the hole blocking layer is within these ranges, excellent hole blocking characteristics may be obtained without a substantial increase in driving voltage.

The electron transport layer may include at least one of 2,9-dimethyl-4,7-diphenyl-1,10-phenanthroline (BCP), 4,7-diphenyl-1,10-phenanthroline (Bphen), 1,3,5-tri(1-phenyl-1H-benzo[d]imidazol-2-yl)benzene (TPBi), tris(8-hydroxyquinolinato)aluminum ($Alq_3$), bis(2-methyl-8-quinolinolato-N1,O8)-(1,1'-biphenyl-4-olato)aluminum (BAlq), 3-(4-biphenylyl)-4-phenyl-5-tert-butylphenyl-1,2,4-triazole (TAZ), 4-(naphthalen-1-yl)-3,5 -diphenyl-4H-1,2,4-triazole (NTAZ), or a combination thereof, but embodiments are not limited thereto:

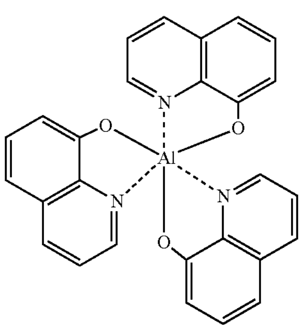

$Alq_3$

-continued

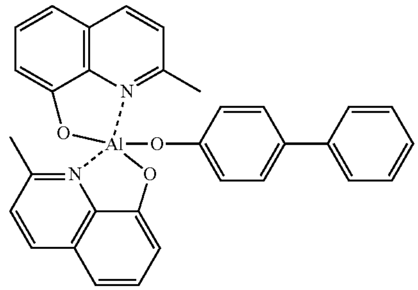

BAlq

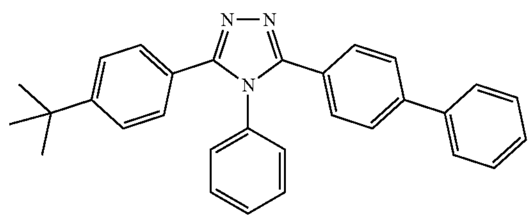

TAZ

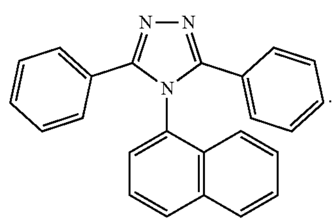

NTAZ

In one or more embodiments, the electron transport layer may include one of Compounds ET1 to ET25, or a combination thereof, but embodiments are not limited thereto:

ET1

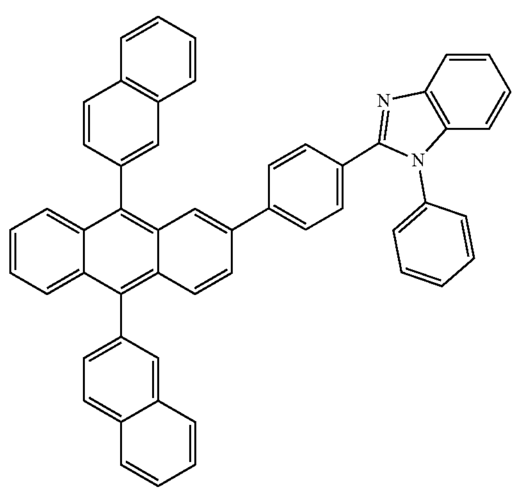

-continued
ET2
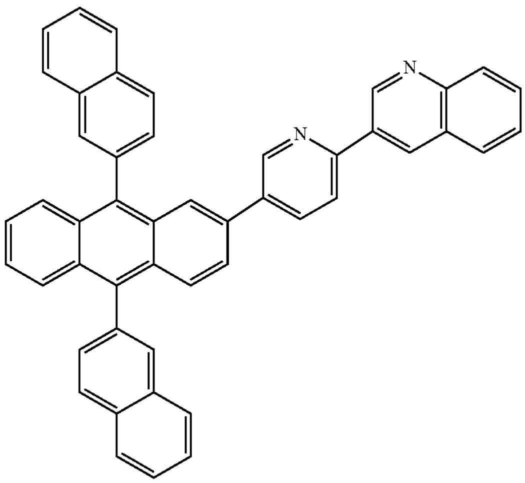
ET3
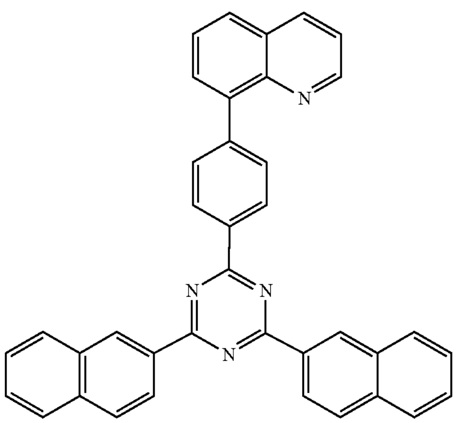
ET4
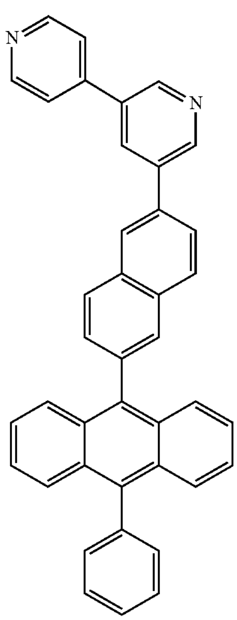
-continued
ET5
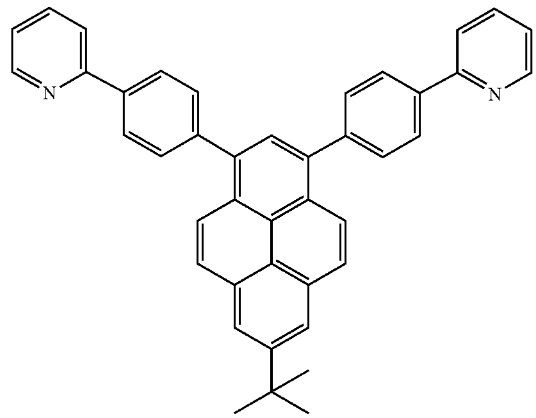
ET6
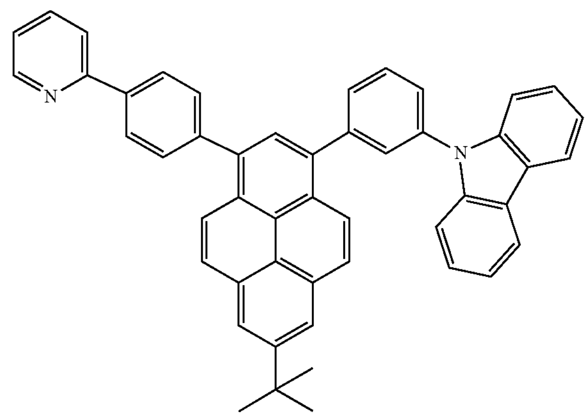
ET7
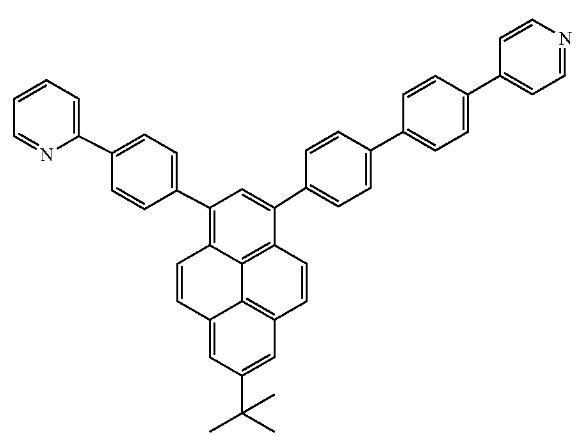

-continued
ET8
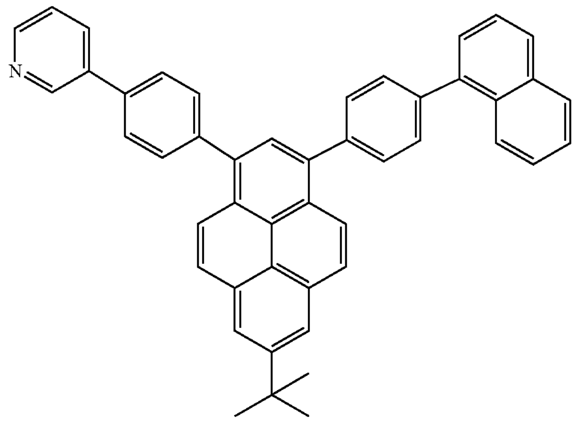
ET9
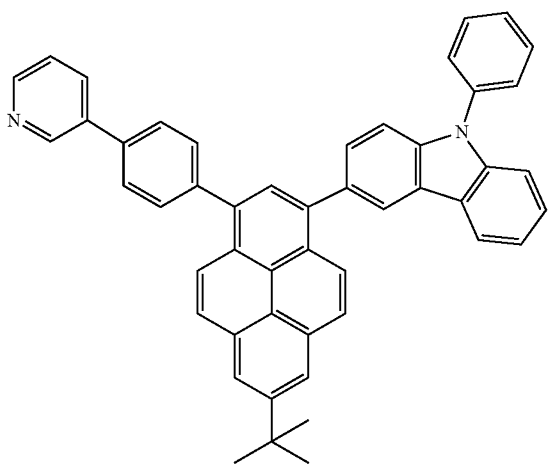
ET10
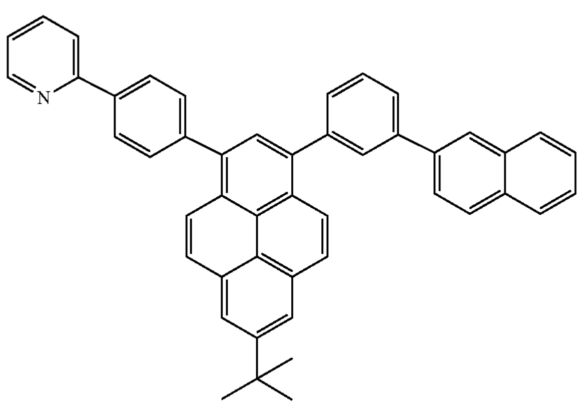
ET11
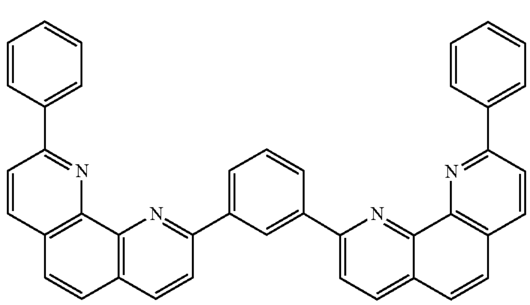
-continued
ET12
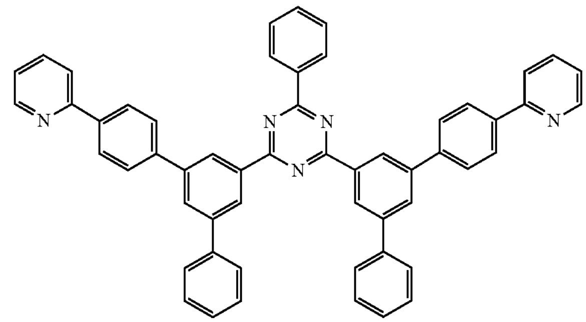
ET13
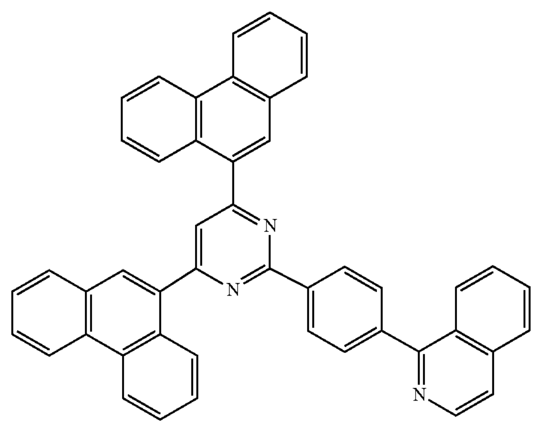
ET14
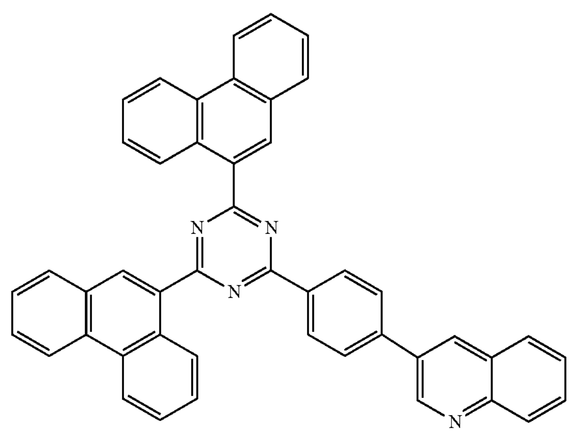
ET15
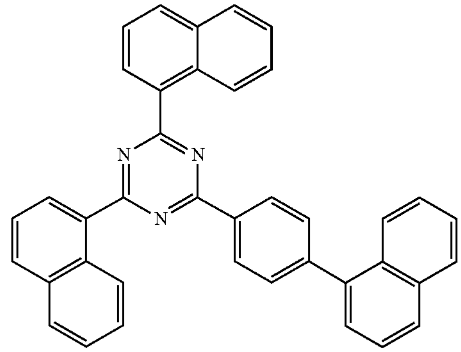

-continued
ET16
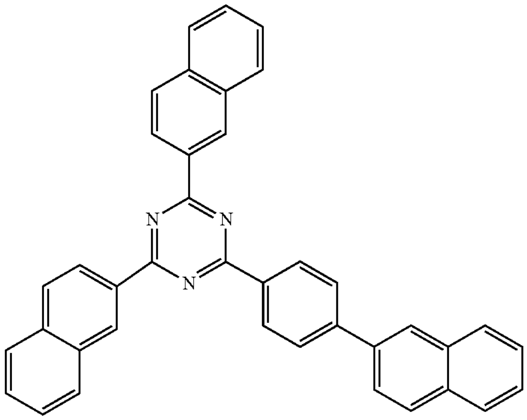
ET17
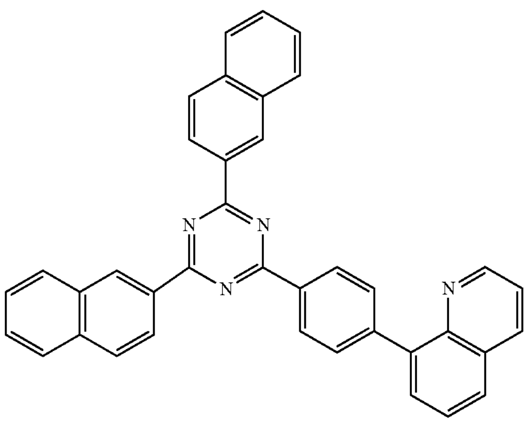
ET18
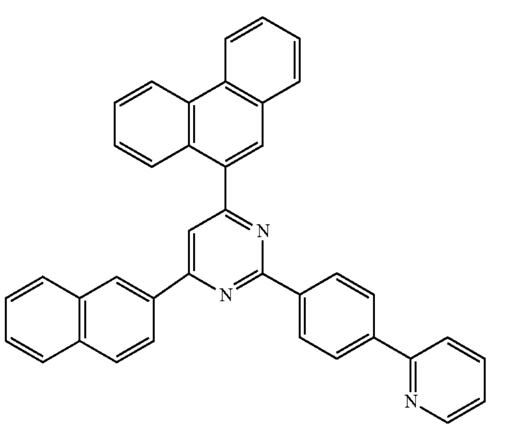
-continued
ET19
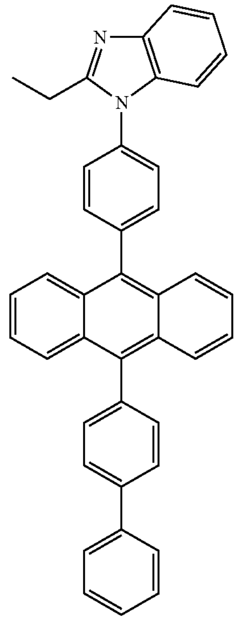
ET20
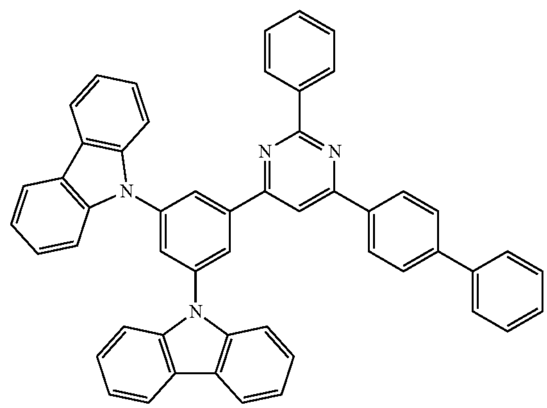
ET21
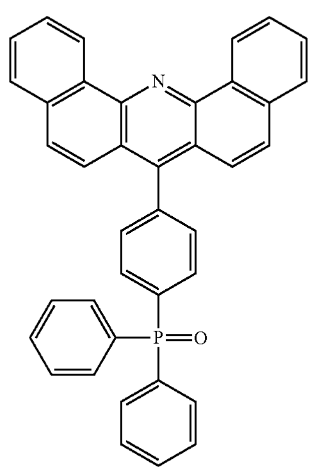

-continued

ET22

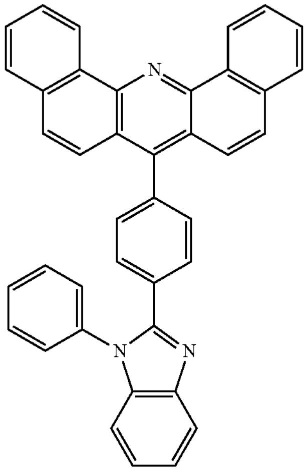

ET23

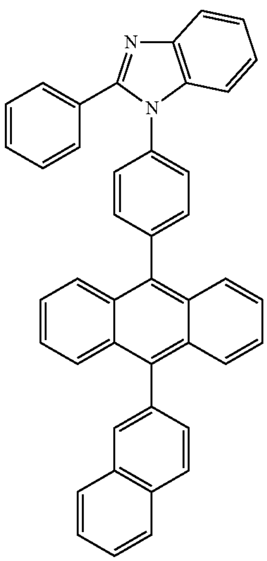

ET24

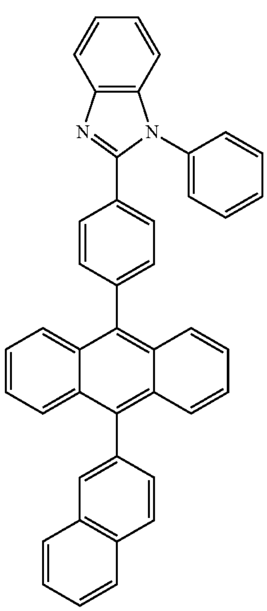

-continued

ET25

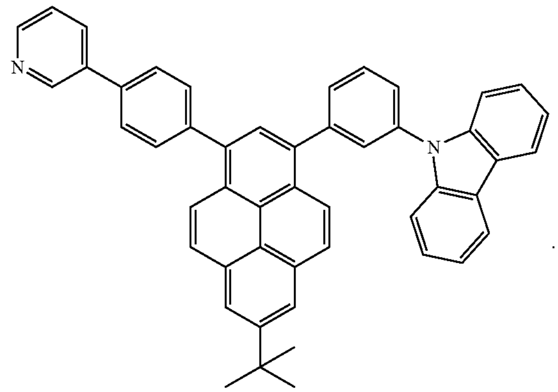

A thickness of the electron transport layer may be in the range of about 100 Å to about 1,000 Å, for example, about 150 Å to about 500 Å. When the thickness of the electron transport layer is within the range described above, the electron transport layer may have satisfactory electron transporting characteristics without a substantial increase in driving voltage.

The electron transport layer may include a metal-containing material in addition to the material as described herein.

The metal-containing material may include a Li complex. The Li complex may include, for example, Compound ET-D1 or ET-D2, but embodiments are not limited thereto:

ET-D1

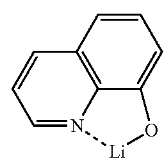

ET-D2

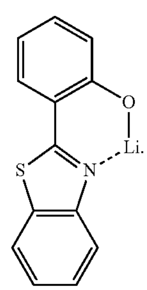

The electron transport region may include an electron injection layer that promotes the flow of electrons from the second electrode 19 thereinto.

The electron injection layer may include at least one of LiF, NaCl, CsF, $Li_2O$, BaO, Yb, Compound ET-D1, Compound ET-D2, or a combination thereof, but embodiments are not limited thereto A thickness of the electron injection layer may be about 1 Å to about 100 Å, and, for example, about 3 Å to about 90 Å. When the thickness of the electron injection layer is within the ranges described above, satisfactory electron injection characteristics may be obtained without a substantial increase in driving voltage.

A second electrode 19 may be located above the electron transport region. The second electrode 19 may be a cathode.

A material for forming the second electrode 19 may be a metal, an alloy, an electrically conductive compound, or a combination thereof, which have a relatively low work function. For example, the material for forming the second electrode 19 may be Li, Mg, Al, Ag, Al—Li, Ca, Mg—In, Mg—Ag, or the like. In one or more embodiments, to manufacture a top-emission type light-emitting device, a transparent or semi-transparent electrode formed using ITO or IZO may be used as the second electrode 19.

Explanation of Terms

The term "$C_1$-$C_{60}$ alkyl group" as used herein refers to a linear or branched saturated aliphatic hydrocarbons monovalent group having 1 to 60 carbon atoms, and the term "$C_1$-$C_{60}$ alkylene group-as used herein refers to a divalent group having the same structure as the $C_1$-$C_{60}$ alkyl group.

Non-limiting examples of the $C_1$-$C_{60}$ alkyl group, the $C_1$-$C_{20}$ alkyl group, and/or the $C_1$-$C_{10}$ alkyl group may include a methyl group, an ethyl group, an n-propyl group, an isopropyl group, an n-butyl group, a sec-butyl group, an isobutyl group, a tert-butyl group, an n-pentyl group, a tert-pentyl group, a neopentyl group, an isopentyl group, a sec-pentyl group, a 3-pentyl group, a sec-isopentyl group, an n-hexyl group, an isohexyl group, a sec-hexyl group, a tert-hexyl group, an n-heptyl group, an isoheptyl group, a sec-heptyl group, a tert-heptyl group, an n-octyl group, an isooctyl group, a sec-octyl group, a tert-octyl group, an n-nonyl group, an isononyl group, a sec-nonyl group, a tert-nonyl group, an n-decyl group, an isodecyl group, a sec-decyl group, a tert-decyl group, or the like, each unsubstituted or substituted with at least one of a methyl group, an ethyl group, an n-propyl group, an isopropyl group, an n-butyl group, a sec-butyl group, an isobutyl group, a tert-butyl group, an n-pentyl group, a tert-pentyl group, a neopentyl group, an isopentyl group, a sec-pentyl group, a 3-pentyl group, a sec-isopentyl group, an n-hexyl group, an isohexyl group, a sec-hexyl group, a tert-hexyl group, an n-heptyl group, an isoheptyl group, a sec-heptyl group, a tert-heptyl group, an n-octyl group, an isooctyl group, a sec-octyl group, a tert-octyl group, an n-nonyl group, an isononyl group, a sec-nonyl group, a tert-nonyl group, an n-decyl group, an isodecyl group, a sec-decyl group, a tert-decyl group, or a combination thereof. For example, Formula 9-33 is a branched $C_6$ alkyl group, for example, a tert-butyl group that is substituted with two methyl groups.

The term "$C_1$-$C_{60}$ alkoxy group" used herein refers to a monovalent group represented by-$OA_{101}$ (wherein $A_{101}$ is the $C_1$-$C_{60}$ alkyl group), and non-limiting examples thereof may include a methoxy group, an ethoxy group, a propoxy group, a butoxy group, a pentoxy group, or the like.

The term "$C_1$-$C_{60}$ alkylthio group" as used herein refers to a monovalent group represented by-$SA_{101}$ (wherein $A_{101}$ is the $C_1$-$C_{60}$ alkyl group).

The term "$C_2$-$C_{60}$ alkenyl group" as used herein refers to a hydrocarbon group formed by substituting at least one carbon-carbon double bond in the middle or at the terminus of the $C_2$-$C_{60}$ alkyl group, and non-limiting examples thereof may include an ethenyl group, a propenyl group, a butenyl group, or the like. The term "$C_2$-$C_{60}$ alkenylene group" as used herein refers to a divalent group having the same structure as the $C_2$-$C_{60}$ alkenyl group.

The term "$C_2$-$C_6$ alkynyl group" as used herein refers to a hydrocarbon group formed by substituting at least one carbon-carbon triple bond in the middle or at the terminus of the $C_2$-$C_{60}$ alkyl group, and non-limiting examples thereof may include an ethynyl group, a propynyl group, or the like. The term "$C_2$-$C_{60}$ alkynylene group" as used herein refers to a divalent group having the same structure as the $C_2$-$C_{60}$ alkynyl group.

The term "$C_3$-$C_{10}$ cycloalkyl group" as used herein refers to a monovalent saturated hydrocarbon cyclic group having 3 to 10 carbon atoms, and the $C_3$-$C_{10}$ cycloalkylene group is a divalent group having the same structure as the $C_3$-$C_{10}$ cycloalkyl group.

Non-limiting examples of the $C_3$-$C_{10}$ cycloalkyl group may include a cyclopropyl group, a cyclobutyl group, a cyclopentyl, cyclohexyl group, a cycloheptyl group, a cyclooctyl group, an adamantanyl group, a norbornanyl group (or a bicyclo[2.2.1]heptyl group), a bicyclo[1.1.1]pentyl group, a bicyclo[2.1.1]hexyl group, a bicyclo[2.2.2]octyl group, or the like.

The term "$C_1$-$C_{10}$ heterocycloalkyl group" as used herein refers to a saturated monovalent cyclic group that includes at least one hetero atom selected from N, O, P, Si, S, Se, Ge, and B as a ring-forming atom and 1 to 10 carbon atoms as ring-forming atom(s), and the term "$C_1$-$C_{10}$ heterocycloalkylene group" as used herein refers to a divalent group having the same structure as the $C_1$-$C_{10}$ heterocycloalkyl group.

Non-limiting examples of the $C_1$-$C_{10}$ heterocycloalkyl group may include a silolanyl group, a silinanyl group, a tetrahydrofuranyl group, a tetrahydro-2H-pyranyl group, a tetrahydrothiophenyl group, or the like.

The term "$C_3$-$C_{10}$ cycloalkenyl group" as used herein refers to a monovalent monocyclic group that has 3 to 10 carbon atoms and at least one carbon-carbon double bond in the ring thereof and no aromaticity, and non-limiting examples thereof may include a cyclopentenyl group, a cyclohexenyl group, a cycloheptenyl group, or the like. The term "$C_3$-$C_{10}$ cycloalkenylene group" as used herein refers to a divalent group having the same structure as the $C_3$-$C_{10}$ cycloalkenyl group.

The term "$C_1$-$C_{10}$ heterocycloalkenyl group" as used herein refers to a monovalent monocyclic group that has at least one hetero atom selected from N, O, P, Si, S, Se, Ge, and B as a ring-forming atom, 1 to 10 carbon atoms as ring-forming atom(s), and at least one double bond in its ring. Non-limiting examples of the $C_1$-$C_{10}$ heterocycloalkenyl group may include a 2,3-dihydrofuranyl group, a 2,3-dihydrothiophenyl group, or the like. The term "$C_1$-$C_{10}$ heterocycloalkenylene group" as used herein refers to a divalent group having the same structure as the $C_1$-$C_{10}$ heterocycloalkenyl group.

The term "$C_6$-$C_{60}$ aryl group" as used herein refers to a monovalent group having a carbocyclic aromatic ring system having 6 to 60 carbon atoms, and the term "$C_6$-$C_{60}$ arylene group" as used herein refers to a divalent group having a carbocyclic aromatic ring system having 6 to 60 carbon atoms. Non-limiting examples of the $C_6$-$C_{60}$ aryl group may include a phenyl group, a naphthyl group, an anthracenyl group, a phenanthrenyl group, a pyrenyl group, a chrysenyl group, or the like. When the $C_6$-$C_{60}$ aryl group and the $C_6$-$C_{60}$ arylene group each include two or more rings, the rings may be fused to each other.

The term "$C_7$-$C_{60}$ alkyl aryl group" as used herein refers to a $C_6$-$C_{60}$ aryl group substituted with at least one $C_1$-$C_{60}$ alkyl group. The term "$C_7$-$C_{60}$ aryl alkyl group" as used herein refers to a $C_1$-$C_{60}$ alkyl group substituted with at least one $C_6$-$C_{60}$ aryl group.

The term "$C_1$-$C_{60}$ heteroaryl group" as used herein refers to a monovalent group that includes a cyclic aromatic system having at least one hetero atom selected from N, O, P, Si, S, Se, Ge, and B as a ring-forming atom and 1 to 60 carbon atoms as ring-forming atom(s), and the term "$C_1$-$C_{60}$ heteroarylene group" as used herein refers to a divalent group that includes a cyclic aromatic system having at least one hetero atom selected from N, O, P, Si, S, Se, Ge, and B as a ring-forming atom and 1 to 60 carbon atoms as ring-forming atom(s). Non-limiting examples of the $C_1$-$C_{60}$ heteroaryl group may include a pyridinyl group, a pyrimidinyl group, a pyrazinyl group, a pyridazinyl group, a triazinyl group, a quinolinyl group, an isoquinolinyl group, or the like. When the $C_1$-$C_{60}$ heteroaryl group and the $C_1$-$C_{60}$ heteroarylene group each include two or more rings, the rings may be fused to each other.

The term "$C_2$-$C_{60}$ alkyl heteroaryl group" as used herein refers to a $C_1$-$C_{60}$ heteroaryl group substituted with at least one $C_1$-$C_{60}$ alkyl group. The term "$C_2$-$C_{60}$ heteroaryl alkyl group" as used herein refers to a $C_1$-$C_{60}$ alkyl group substituted with at least one $C_1$-$C_{60}$ heteroaryl group.

The term "$C_6$-$C_{60}$ aryloxy group" as used herein indicates -$OA_{102}$ (wherein $A_{102}$ indicates the $C_6$-$C_{60}$ aryl group), the $C_6$-$C_{60}$ arylthio group indicates -$SA_{103}$ (wherein $A_{103}$ indicates the $C_6$-$C_{60}$ aryl group), and the $C_1$-$C_{60}$ alkylthio group indicates-$SA_{104}$ (wherein $A_{104}$ indicates the $C_1$-$C_{60}$ alkyl group).

The term "monovalent non-aromatic condensed polycyclic group" as used herein refers to a monovalent group (for example, having about 8 to about 60 carbon atoms) having two or more rings condensed to each other, only carbon atoms as ring-forming atoms, and no aromaticity in its entire molecular structure. Non-limiting examples of the monovalent non-aromatic condensed polycyclic group may include a fluorenyl group or the like. The term "divalent non-aromatic condensed polycyclic group" as used herein refers to a divalent group having the same structure as the monovalent non-aromatic condensed polycyclic group described above.

The term "monovalent non-aromatic condensed heteropolycyclic group" as used herein refers to a monovalent group (for example, having about 1 to about 60 carbon atoms) having two or more rings condensed to each other, at least one hetero atom selected from N, O, P, Si, S, Se, Ge, and B, other than carbon atoms, as a ring-forming atom, and no aromaticity in its entire molecular structure. Non-limiting examples of the monovalent non-aromatic condensed heteropolycyclic group may include a carbazolyl group or the like. The term "divalent non-aromatic condensed heteropolycyclic group" as used herein refers to a divalent group having the same structure as the monovalent non-aromatic condensed heteropolycyclic group described above.

The term "$C_5$-$C_{30}$ carbocyclic group" as used herein refers to a saturated or unsaturated cyclic group having, as a ring-forming atom, 5 to 30 carbon atoms only. The $C_5$-$C_{30}$ carbocyclic group may be a monocyclic group or a polycyclic group. Non-limiting examples of the "$C_5$-$C_{30}$ carbocyclic group (unsubstituted or substituted with at least one $R_{10a}$)" used herein are an adamantane group, a norbornene group, a bicyclo[1.1.1]pentane group, a bicyclo[2.1.1]hexane group, a bicyclo[2.2.1]heptane(norbornane) group, a bicyclo[2.2.2]octane group, a cyclopentane group, a cyclohexane group, a cyclohexene group, a benzene group, a naphthalene group, an anthracene group, a phenanthrene group, a triphenylene group, a pyrene group, a chrysene group, a 1,2,3,4-tetrahydronaphthalene group, a cyclopentadiene group, a fluorene group, or the like, each unsubstituted or substituted with at least one $R_{10a}$.

The term "$C_1$-$C_{30}$ heterocyclic group" as used herein refers to a saturated or unsaturated cyclic group having, as a ring-forming atom, at least one heteroatom selected from N, O, P, Si, S, Se, Ge, and B other than 1 to 30 carbon atoms as ring-forming atom(s). The $C_1$-$C_{30}$ heterocyclic group may be a monocyclic group or a polycyclic group. The "$C_1$-$C_{30}$ heterocyclic group (unsubstituted or substituted with at least one $R_{10a}$)" may be, for example, a thiophene group, a furan group, a pyrrole group, a silole group, borole group, a phosphole group, a selenophene group, a germole group, a benzothiophene group, a benzofuran group, an indole group, a benzosilole group, a benzoborole group, a benzophosphole group, a benzoselenophene group, a benzogermole group, a dibenzothiophene group, a dibenzofuran group, a carbazole group, a dibenzosilole group, a dibenzoborole group, a dibenzophosphole group, a dibenzoselenophene group, a dibenzogermole group, a dibenzothiophene 5-oxide group, a 9H-fluoren-9-one group, a dibenzothiophene 5,5-dioxide group, an azabenzothiophene group, an azabenzofuran group, an azaindole group, an azaindene group, an azabenzosilole group, an azabenzoborole group, an azabenzophosphole group, an azabenzoselenophene group, an azabenzogermole group, an azadibenzothiophene group, an azadibenzofuran group, an azacarbazole group, an azafluorene group, an azadibenzosilole group, an azadibenzoborole group, an azadibenzophosphole group, an azadibenzoselenophene group, an azadibenzogermole group, an azadibenzothiophene 5-oxide group, an aza-9H-fluoren-9-one group, an azadibenzothiophene 5,5-dioxide group, a pyridine group, a pyrimidine group, a pyrazine group, a pyridazine group, a triazine group, a quinoline group, an isoquinoline group, a quinoxaline group, a quinazoline group, a phenanthroline group, a pyrazole group, an imidazole group, a triazole group, an oxazole group, an isooxazole group, a thiazole group, an isothiazole group, an oxadiazole group, a thiadiazole group, a benzopyrazole group, a benzimidazole group, a benzoxazole group, a benzothiazole group, a benzoxadiazole group, a benzothiadiazole group, a 5,6,7,8-tetrahydroisoquinoline group, a 5,6,7,8-tetrahydroquinoline group, or the like, each unsubstituted or substituted with at least one $R_{10a}$.

Examples of the "$C_5$-$C_{30}$ carbocyclic group" and "$C_1$-$C_{30}$ heterocyclic group" as used herein include i) a first ring, ii) a second ring, iii) a condensed ring system in which two or more first rings are condensed with each other, iv) a condensed ring system in which two or more second rings are condensed with each other, or v) a condensed ring system in which at least one first ring is condensed with at least one second ring, wherein the first ring may be a cyclopentane group, a cyclopentene group, a furan group, a thiophene group, a pyrrole group, a silole group, a borole group, a phosphole group, a germole group, a selenophene group, an oxazole group, an oxadiazole group, an oxatriazole group, a thiazole group, a thiadiazole group, a thiatriazole group, a pyrazole group, an imidazole group, a triazole group, a tetrazole group, or an azasilole group, and the second ring may be an adamantane group, a norbornane group, a norbornene group, a cyclohexane group, a cyclohexene group, a benzene group, a pyridine group, a pyrimidine group, a pyrazine group, a pyridazine group, or a triazine group.

The terms "fluorinated $C_1$-$C_{60}$ alkyl group (or a fluorinated $C_1$-$C_{20}$ alkyl group or the like)", "fluorinated $C_3$-$C_{10}$ cycloalkyl group", "fluorinated $C_1$-$C_{10}$ heterocycloalkyl group," and "fluorinated phenyl group" respectively indicate a $C_1$-$C_{60}$ alkyl group (or a $C_1$-$C_{20}$ alkyl group or the like), a $C_3$-$C_{10}$ cycloalkyl group, a $C_1$-$C_{10}$ heterocycloalkyl group, and a phenyl group, each substituted with at least one fluoro group (—F). For example, the term "fluorinated $C_1$ alkyl group (that is, a fluorinated methyl group)" includes —$CF_3$, —$CF_2H$, and —$CFH_2$. The "fluorinated $C_1$-$C_{60}$ alkyl group (or, a fluorinated $C_1$-$C_{20}$ alkyl group, or the like)", "the fluorinated $C_3$-$C_{10}$ cycloalkyl group", "the fluorinated $C_1$-$C_{10}$ heterocycloalkyl group", or "the fluorinated phenyl group" may be i) a fully fluorinated $C_1$-$C_{60}$ alkyl group (or, a fully fluorinated $C_1$-$C_{20}$ alkyl group, or the like), a fully fluorinated $C_3$-$C_{10}$ cycloalkyl group, a fully fluorinated $C_1$-$C_{10}$ heterocycloalkyl group, or a fully fluorinated phenyl group, wherein, in each group, all hydrogen included therein is substituted with a fluoro group, or ii) a partially fluorinated $C_1$-$C_{60}$ alkyl group (or, a partially fluorinated $C_1$-$C_{20}$ alkyl group, or the like), a partially fluorinated $C_3$-$C_{10}$ cycloalkyl group, a partially fluorinated $C_1$-$C_{10}$ heterocycloalkyl group, or partially fluorinated phenyl group, wherein, in each group, all hydrogen included therein is not substituted with a fluoro group.

The terms "deuterated $C_1$-$C_{60}$ alkyl group (or a deuterated $C_1$-$C_{20}$ alkyl group or the like)", "deuterated $C_3$-$C_{10}$ cycloalkyl group", "deuterated $C_1$-$C_{10}$ heterocycloalkyl group," and "deuterated phenyl group" respectively indicate a $C_1$-$C_{60}$ alkyl group (or a $C_1$-$C_{20}$ alkyl group or the like), a $C_3$-$C_{10}$ cycloalkyl group, a $C_1$-$C_{10}$ heterocycloalkyl group, and a phenyl group, each substituted with at least one deuterium. For example, the "deuterated $C_1$ alkyl group (that is, the deuterated methyl group)" may include —$CD_3$, —$CD_2H$, and —$CDH_2$, and examples of the "deuterated $C_3$-$C_{10}$ cycloalkyl group" are, for example, Formula 10-501 and the like. The "deuterated $C_1$-$C_{60}$ alkyl group (or, the deuterated $C_1$-$C_{20}$ alkyl group or the like)", "the deuterated $C_3$-$C_{10}$ cycloalkyl group", "the deuterated $C_1$-$C_{10}$ heterocycloalkyl group", or "the deuterated phenyl group" may be i) a fully deuterated $C_1$-$C_{60}$ alkyl group (or, a fully deuterated $C_1$-$C_{20}$ alkyl group or the like), a fully deuterated $C_3$-$C_{10}$ cycloalkyl group, a fully deuterated $C_1$-$C_{10}$ heterocycloalkyl group, or a fully deuterated phenyl group, in which, in each group, all hydrogen included therein are substituted with deuterium, or ii) a partially deuterated $C_1$-$C_{60}$ alkyl group (or, a partially deuterated $C_1$-$C_{20}$ alkyl group or the like), a partially deuterated $C_3$-$C_{10}$ cycloalkyl group, a partially deuterated $C_1$-$C_{10}$ heterocycloalkyl group, or a partially deuterated phenyl group, in which, in each group, all hydrogen included therein are not substituted with deuterium.

The term "($C_1$-$C_{20}$ alkyl)'X' group" as used herein refers to a 'X' group that is substituted with at least one $C_1$-$C_{20}$ alkyl group. For example, the term "($C_1$-$C_{20}$ alkyl)$C_3$-$C_{10}$ cycloalkyl group" as used herein refers to a $C_3$-$C_{10}$ cycloalkyl group substituted with at least one $C_1$-$C_{20}$ alkyl group, and the term "($C_1$-$C_{20}$ alkyl)phenyl group" as used herein refers to a phenyl group substituted with at least one $C_1$-$C_{20}$ alkyl group. An example of a ($C_1$ alkyl) phenyl group may include a toluyl group or the like.

The terms "an azaindole group, an azabenzoborole group, an azabenzophosphole group, an azaindene group, an azabenzosilole group, an azabenzogermole group, an azabenzothiophene group, an azabenzoselenophene group, an azabenzofuran group, an azacarbazole group, an azadibenzoborole group, an azadibenzophosphole group, an azafluorene group, an azadibenzosilole group, an azadibenzogermole group, an azadibenzothiophene group, an azadibenzoselenophene group, an azadibenzofuran group, an azadibenzothiophene 5-oxide group, an aza-9H-fluoren-9-one group, and an azadibenzothiophene 5,5-dioxide group" respectively refer to heterocyclic groups having the same backbones as "an indole group, a benzoborole group, a benzophosphole group, an indene group, a benzosilole group, a benzogermole group, a benzothiophene group, a benzoselenophene group, a benzofuran group, a carbazole group, a dibenzoborole group, a dibenzophosphole group, a fluorene group, a dibenzosilole group, a dibenzogermole group, a dibenzothiophene group, a dibenzoselenophene group, a dibenzofuran group, a dibenzothiophene 5-oxide group, a 9H-fluoren-9-one group, and a dibenzothiophene 5,5-dioxide group," refer to the base group in which, in each group, at least one carbon selected from ring-forming carbons is substituted with nitrogen.

At least one substituent of the substituted $C_5$-$C_{30}$ carbocyclic group, the substituted $C_1$-$C_{30}$ heterocyclic group, the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_1$-$C_{60}$ alkylthio group, the substituted $C_3$-$C_{10}$ cycloalkyl group, the substituted $C_1$-$C_{10}$ heterocycloalkyl group, the substituted $C_3$-$C_{10}$ cycloalkenyl group, the substituted $C_1$-$C_{10}$ heterocycloalkenyl group, the substituted $C_6$-$C_{60}$ aryl group, the substituted $C_7$-$C_{60}$ alkyl aryl group, the substituted $C_7$-$C_{60}$ aryl alkyl group, the substituted $C_6$-$C_{60}$ aryloxy group, the substituted $C_6$-$C_{60}$ arylthio group, the substituted $C_1$-$C_{60}$ heteroaryl group, the substituted $C_2$-$C_{60}$ alkyl heteroaryl group, the substituted $C_2$-$C_{60}$ heteroaryl alkyl group, the substituted $C_1$-$C_{60}$ heteroaryloxy group, the substituted $C_1$-$C_{60}$ heteroarylthio group, the substituted monovalent non-aromatic condensed polycyclic group, and the substituted monovalent non-aromatic condensed heteropolycyclic group may be:

deuterium, —F, —Cl, —Br, —I, —$SF_5$, —$CD_3$, —$CD_2H$, —$CDH_2$, —$CF_3$, —$CF_2H$, —$CFH_2$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, or a $C_1$-$C_{60}$ alkylthio group;

a $C_1$-$C_{60}$ alkyl group, a $C_2$-$C_{60}$ alkenyl group, a $C_2$-$C_{60}$ alkynyl group, a $C_1$-$C_{60}$ alkoxy group, or a $C_1$-$C_{60}$ alkylthio group, each substituted with at least one of deuterium, —F, —Cl, —Br, —I, —$SF_5$, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_7$-$C_{60}$ alkyl aryl group, a $C_6$-$C_{60}$ aryloxy group, a $C_6$-$C_{60}$ arylthio group, a $C_1$-$C_{60}$ heteroaryl group, a $C_2$-$C_{60}$ alkyl heteroaryl group, a $C_1$-$C_{60}$ heteroaryloxy group, a $C_1$-$C_{60}$ heteroarylthio group, a monovalent non-aromatic condensed polycyclic group, a monovalent non-aromatic condensed heteropolycyclic group, —$N(Q_{11})(Q_{12})$, —$Si(Q_{13})(Q_{14})(Q_{15})$, —$Ge(Q_{13})(Q_{14})(Q_{15})$, —$B(Q_{16})(Q_{17})$, —$P(=O)(Q_{18})(Q_{19})$, —$P(Q_{18})(Q_{19})$, or a combination thereof;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_7$-$C_{60}$ alkyl aryl group, a $C_6$-$C_{60}$ aryloxy group, a $C_6$-$C_{60}$ arylthio group, a $C_1$-$C_{60}$ heteroaryl group, a $C_2$-$C_{60}$ alkyl heteroaryl group, a $C_1$-$C_{60}$ heteroaryloxy group, a $C_1$-$C_{60}$ heteroarylthio group, a monovalent non-aromatic condensed polycyclic group, or a monovalent non-aromatic condensed heteropolycyclic group, each unsubstituted or substituted with at least one of deuterium, —F, —Cl, —Br, —I, —$SF_5$, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_1$-$C_{60}$ alkylthio group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_7$-$C_{60}$ alkyl aryl group, a $C_7$-$C_{60}$ aryl alkyl group, a $C_6$-$C_{60}$ aryloxy group, a $C_6$-$C_{60}$ arylthio group, a $C_1$-$C_{60}$ heteroaryl group, a $C_2$-$C_{60}$ alkyl heteroaryl group, a $C_2$-$C_{60}$ heteroaryl alkyl group, a $C_1$-$C_{60}$ heteroaryloxy group, a $C_1$-$C_{60}$ heteroarylthio group, a monovalent non-aromatic condensed polycyclic group, a monovalent non-aromatic condensed heteropolycyclic group, —$N(Q_{21})(Q_{22})$, —$Si(Q_{23})(Q_{24})(Q_{25})$, —$Ge(Q_{23})(Q_{24})(Q_{25})$, —$B(Q_{26})(Q_{27})$, —$P(=O)(Q_{28})(Q_{29})$, —$P(Q_{28})(Q_{29})$, or a combination thereof;

$N(Q_{31})(Q_{32})$, —$Si(Q_{33})(Q_{34})(Q_{35})$, —$Ge(Q_{33})(Q_{34})(Q_{35})$, —$B(Q_{36})(Q_{37})$, —$P(=O)(Q_{38})(Q_{39})$, or —$P(Q_{38})(Q_{39})$; or a combination thereof.

In the present specification, $Q_1$ to $Q_9$, $Q_{11}$ to $Q_{19}$, $Q_{21}$ to $Q_{29}$, and $Q_{31}$ to $Q_{39}$ may each independently be hydrogen, deuterium, —F, —Cl, —Br, —I, —$SF_5$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_7$-$C_{60}$ alkyl aryl group, a substituted or unsubstituted $C_7$-$C_{60}$ aryl alkyl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted $C_2$-$C_{60}$ alkyl heteroaryl group, a substituted or unsubstituted $C_2$-$C_{60}$ heteroaryl alkyl group, a substituted or unsubstituted $C_1$-$C_{60}$ heteroaryloxy group, a substituted or unsubstituted $C_1$-$C_{60}$ heteroarylthio group, a substituted or unsubstituted monovalent non-aromatic condensed polycyclic group, or a substituted or unsubstituted monovalent non-aromatic condensed heteropolycyclic group.

For example, $Q_1$ to $Q_9$, $Q_{11}$ to $Q_{19}$, $Q_{21}$ to $Q_{29}$ and $Q_{31}$ to $Q_{39}$ as described herein may each independently be:

—$CH_3$, —$CD_3$, —$CD_2H$, —$CDH_2$, —$CH_2CH_3$, —$CH_2CD_3$, —$CH_2CD_2H$, —$CH_2CDH_2$, —$CHDCH_3$, —$CHDCD_2H$, —$CHDCDH_2$, —$CHDCD_3$, —$CD_2CD_3$, —$CD_2CD_2H$, or —$CD_2CDH_2$, or an n-propyl group, an isopropyl group, an n-butyl group, a sec-butyl group, an isobutyl group, a tert-butyl group, an n-pentyl group, a tert-pentyl group, a neopentyl group, an isopentyl group, a sec-pentyl group, a 3-pentyl group, a sec-isopentyl group, a phenyl group, a biphenyl group, or a naphthyl group, each unsubstituted or substituted with at least one of deuterium, a $C_1$-$C_{10}$ alkyl group, a phenyl group, or a combination thereof.

Hereinafter, a light-emitting device according to exemplary embodiments are described in further detail with reference to Examples. However, the exemplary embodiments are not limited to the following examples.

EXAMPLES

Synthesis Example 1 (Compound D6)

Synthesis of Compound 6-1

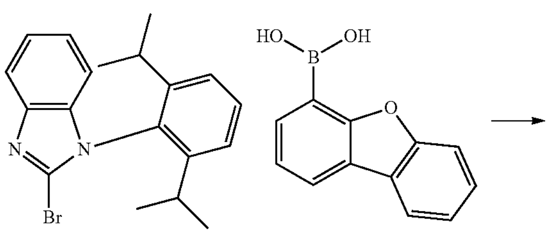

6-1(1)

6-1(2)

-continued

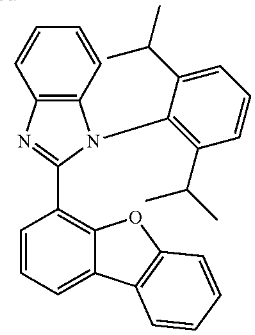

6-1

50 milliliters (mL) of tetrahydrofuran (THF) and 20 mL of deionized (DI) water were mixed with Compound 6-1(1) (5.00 grams (g), 14.00 millimoles (mmol)), Compound 6-1(2) (3.56 g, 16.80 mmol), tetrakis(triphenylphosphine) palladium(0) ($Pd(PPh_3)_4$) (0.81 g, 0.70 mmol), and $K_2CO_3$ (5.80 g, 42.0 mmol), and then, stirred and heated under reflux for 18 hours. After the temperature was allowed to lower to room temperature, an organic layer was extracted using methylene chloride, the organic layer was separated and dried using anhydrous magnesium sulfate ($MgSO_4$), and then the product was obtained by filtration. The solvent was removed under a reduced pressure and the obtained residue was purified by column chromatography (ethyl acetate (EA): hexane=1:6, w/w) to obtain Compound 6-1 (4.3 g, yield of 68%). The synthesis process was repeated to obtain a sufficient amount of Compound 6-1 for using in the next reaction.

Synthesis of Compound 6-2

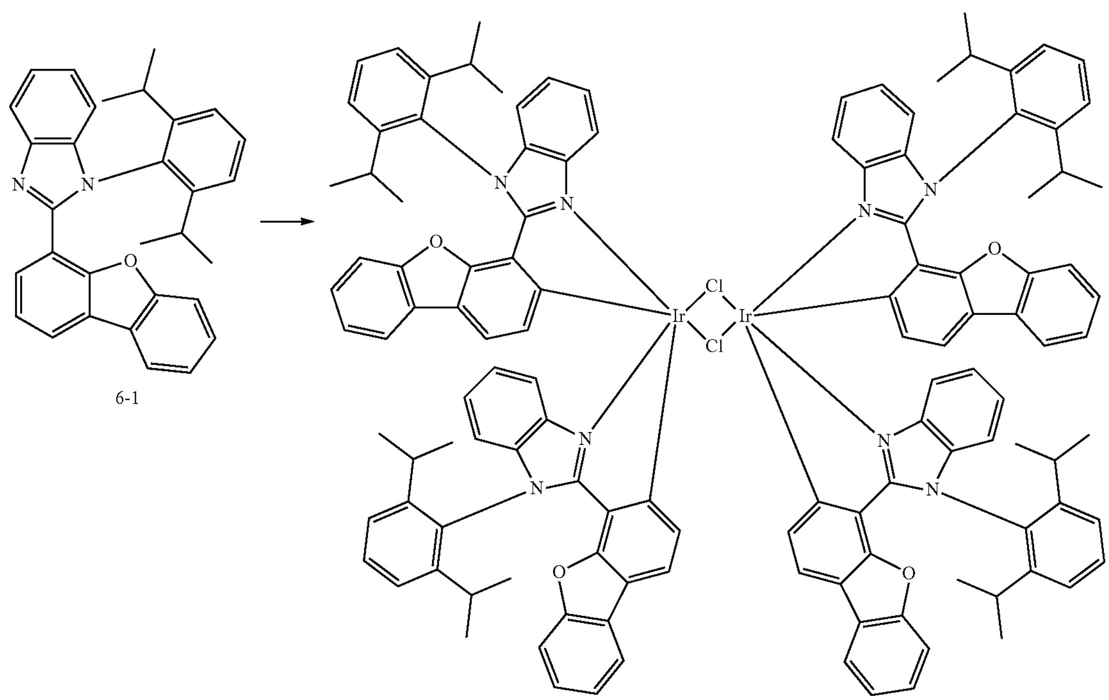

6-1

6-2

Compound 6-1 (7.0 g, 15.81 mmol) and iridium chloride trihydrate (2.68 g, 7.60 mmol) were mixed with 50 mL of 2-ethoxyethanol and 20 mL of DI water, and then, the resultant mixture stirred and heated at reflux for 24 hours. Then, the temperature was allowed to lower to room temperature. The resulting solid was separated by filtration, washed thoroughly using DI water, methanol, and hexane, in the stated order, and the obtained solid was dried in a vacuum oven to obtain Compound 6-2 (6.35 g, yield of 75%).

Synthesis of Compound 6-3

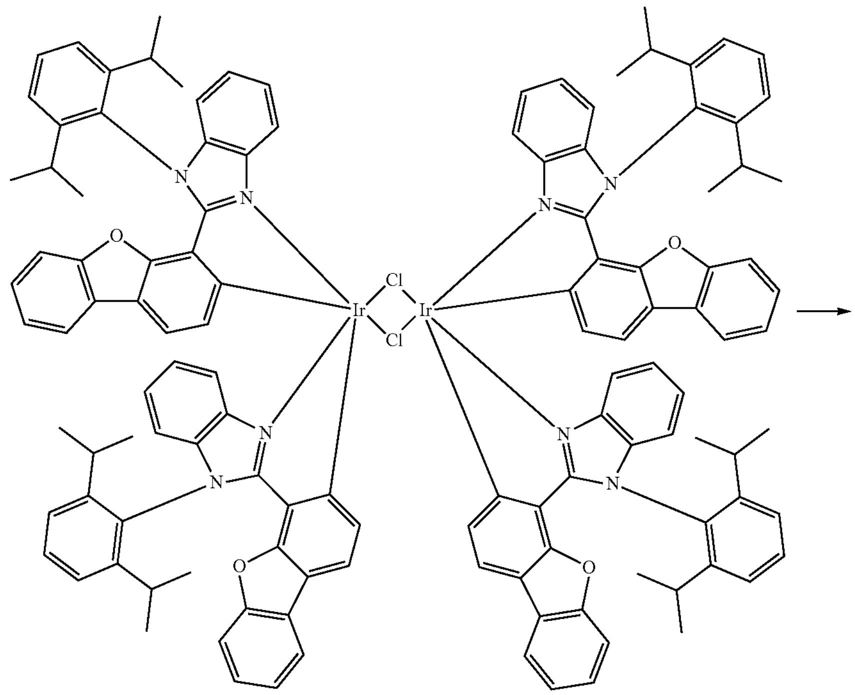

6-2

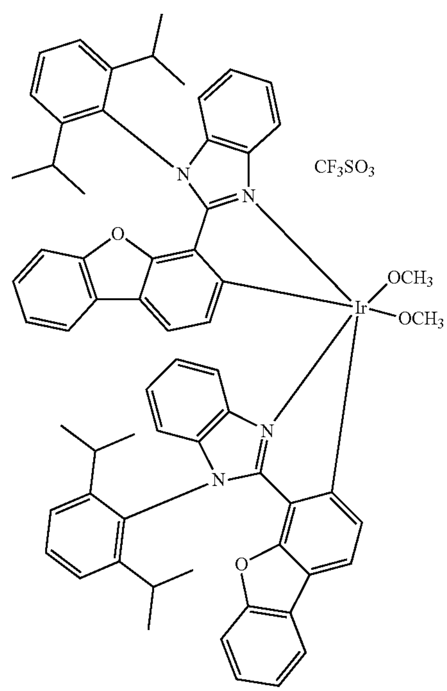

6-3

Compound 6-2 (5.8 g, 2.60 mmol) was mixed with 90 mL of methylene chloride (MC), and then silver trifluoromethanesulfonate (AgOTf) (1.4 g, 5.46 mmol) dissolved in 30 mL of methanol was added thereto. Thereafter, the reaction was stirred at room temperature for 18 hours in a state where light was blocked with an aluminum foil, and then the resulting solid was removed by celite filtration, and the solvent was removed from filtrate under a reduced pressure to obtain a solid (Compound 6-3). The obtained solid was used in the next reaction without an additional purification process.

Synthesis of Compound D6

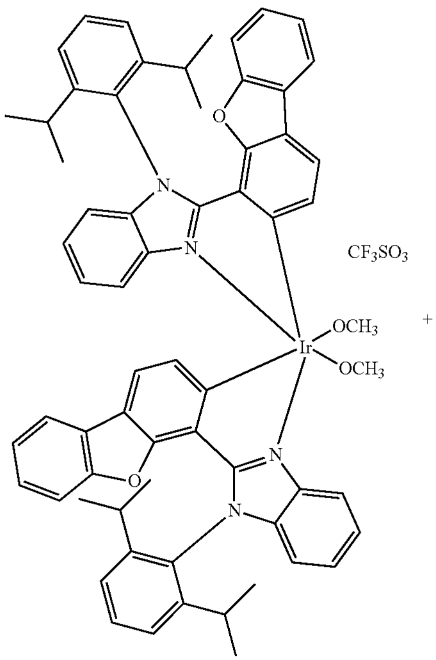

6-3

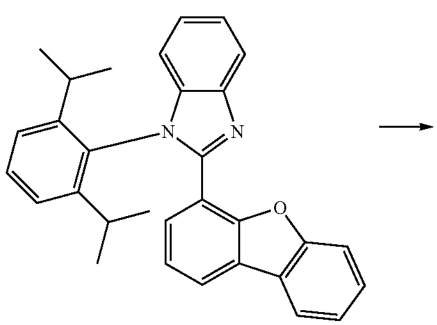

6-1

-continued

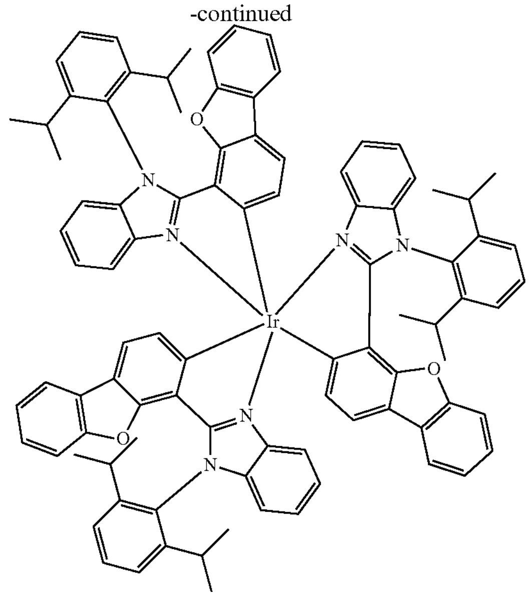

D6

Compound 6-3 (6.45 g, 5.0 mmol) and Compound 6-1 (2.22 g, 5.0 mmol) were mixed with 80 mL of 2-ethoxyethanol and 80 mL of N,N-dimethylformamide, and then, the reaction mixture was stirred and heated under reflux at 120° C. for 24 hours. Then, the temperature was allowed to lower to room temperature. The solvent was removed under a reduced pressure condition, and then, the product was purified by column chromatography (EA/hexane, 1:8 w/w) to obtain Compound D6 (5.3 g, yield of 70%). Compound D6 was characterized by high resolution mass spectrometry using matrix assisted laser desorption ionization (HRMS (MALDI)).

HRMS (MALDI) calculated for $C_{93}H_{81}IrN_6O_3$: m/z: 1523.6033, found: 1523.4889.

Synthesis Example 2 (Compound D7)

Synthesis of Compound 7-1

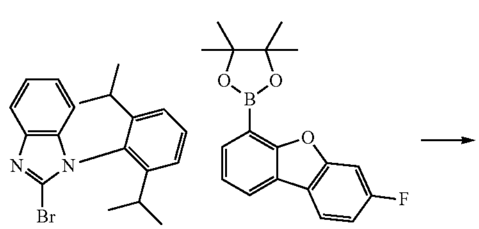

6-1(1) 7-1(2)

-continued

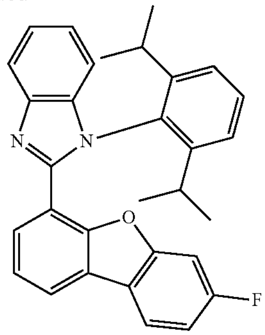

7-1

Compound 7-1 (4.05 g, yield of 62.5%) was obtained in a similar manner as used to synthesize Compound 6-1 of Synthesis Example 1, except that Compound 7-1(2) (5.24 g, 16.80 mmol) was used instead of Compound 6-1(2).

Synthesis of Compound D7

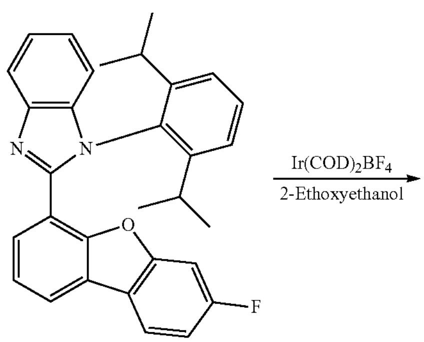

7-1

-continued

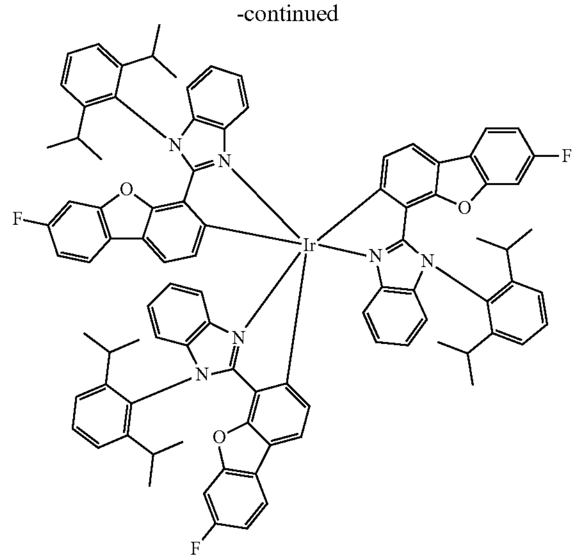

D7

Compound 7-1 (1.96 g, 4.24 mmol) and bis(1,5-cyclooctadiene)iridium(I) tetrafluoroborate ($Ir(COD)_2BF_4$) (0.6 g, 1.21 mmol) were dissolved in 20 mL of 2 -ethoxyethanol, and stirred for 24 hours at 160° C. to undergo a reaction, followed by allowed the temperature to cool to room temperature. The solid thus obtained by filtration was dried, and then, purified by column chromatography (EA:hexane, 1:7 w/w) to obtain Compound D7 (0.85 g, yield of 45%).

HRMS (MALDI) calculated for $C_{93}H_{78}F_3IrN_6O_3$: m/z: 1576.5717, found: 1576.9442.

Evaluation Example 1

The dipole moment (DM), the HOMO energy level, and the LUMO energy level were evaluated with respect to the host and the dopant included in Composition 1 to Composition 24 shown in Tables 2 and 3 according to the method described in Table 1, and based on the evaluation results, value X and value Y were calculated with respect to each composition. Results thereof are shown in Tables 2 and 3.

Each of Composition 1 to Composition 24 includes one type of dopant (first dopant) and two types of hosts (first host and second host), these compositions correspond to a composition in which m1 is 1 and m2 are 2 in the present specification. The amounts of the first dopant, the first host, and the second host included in each composition satisfy the weight fractions of W(D1), W(H1) and W(H2) shown in Table 2.

TABLE 1

| | |
|---|---|
| Method for calculation of dipole moment of dopant | For iridium, the B3LYP/LanL2DZ function was used, and for an organic The respective molecular structures were optimized by using the B3LYP/LanL2DZ function for iridium and the B3LYP/6-31G(D, P) function for an organic ligand, and density functional theory (DFT) calculation was performed using the Gaussian 16 program. As such, the dipole moment of each dopant was calculated. |
| Method for calculation of dipole moment of host | Molecular structure was optimized using the B3LYP/6-31G(D, P) function, and density functional theory (DFT) calculations using the Gaussian 16 program were performed. As such, the dipole moment of each host was calculated. |
| HOMO energy level measurement method | HOMO energy levels were measured by using differential pulse voltammetry using ferrocene as a reference material. In detail, $Bu_4NPF_6$ at a concentration of 0.1M dissolved in dichloromethane was used as an electrolyte, the measurement conditions including a pulse height of 50 mV, a pulse width of 1 sec, a step height of 10 mV, a step width of 2 sec, and a scan rate of 5 mV/sec were used, and $Ag/AgNO_3$ was used as a reference electrode, thereby obtaining |

TABLE 1-continued

| | |
|---|---|
| | a potential(V)-current(mA) graph of each compound. Then, Eoxi_peak, which is an oxidation peak potential of the graph, was evaluated. Subsequently, Eoxi_peak (eV) was substituted for Eoxi_peak in the equation of HOMO(eV) = −4.8-(Eoxi_peak-Eoxi_peak (Ferrocene)) to obtain the HOMO energy level (eV) of each compound. |
| LUMO energy level measurement method | Ered_peak (eV), which is the reduction peak potential of the potential (V)-current (mA) graph of the compound, was evaluated. Subsequently, Ered_peak (eV) was substituted for Ered_peak in the equation of LUMO(eV) = −4.8-(Ered_peak-Ered_peak (Ferrocene)) to obtain the LUMO energy level (eV) of each compound. |

TABLE 2

| | Host | | Dopant | | | | | | | value |
|---|---|---|---|---|---|---|---|---|---|---|
| No. | First host | Second host | First dopant | DM(H1)[1] (debye) | DM(H2)[2] (debye) | DM(D1)[3] (debye) | W(H1)[4] | W(H2)[5] | W(D1)[6] | X[7] (debye) |
| 1 | H-HT1 | H-ET1 | D1 | 0.85 | 2.44 | 6.81 | 0.616 | 0.264 | 0.12 | 1.985 |
| 2 | H-HT1 | H-ET1 | D8 | 0.85 | 2.44 | 5.52 | 0.651 | 0.279 | 0.07 | 1.621 |
| 3 | H-HT1 | H-ET1 | D2 | 0.85 | 2.44 | 5.68 | 0.604 | 0.326 | 0.07 | 1.706 |
| 4 | H-HT3 | H-ET2 | D2 | 0.81 | 2.48 | 5.68 | 0.604 | 0.326 | 0.07 | 1.695 |
| 5 | H-HT3 | H-ET2 | D2 | 0.81 | 2.48 | 5.68 | 0.651 | 0.279 | 0.07 | 1.617 |
| 6 | H-HT4 | H-ET5 | D2 | 1.39 | 0.72 | 5.68 | 0.558 | 0.372 | 0.07 | 1.441 |
| 7 | H-HT4 | H-ET5 | D2 | 1.39 | 0.72 | 5.68 | 0.604 | 0.326 | 0.07 | 1.472 |
| 8 | H-HT4 | H-ET5 | D2 | 1.39 | 0.72 | 5.68 | 0.651 | 0.279 | 0.07 | 1.503 |
| 9 | H-HT4 | H-ET5 | D2 | 1.39 | 0.72 | 5.68 | 0.697 | 0.233 | 0.07 | 1.534 |
| 10 | H-HT3 | H-ET5 | D2 | 0.81 | 0.72 | 5.68 | 0.503 | 0.427 | 0.07 | 1.112 |
| 11 | H-HT3 | H-ET5 | D2 | 0.81 | 0.72 | 5.68 | 0.558 | 0.372 | 0.07 | 1.117 |
| 12 | H-HT3 | H-ET5 | D2 | 0.81 | 0.72 | 5.68 | 0.604 | 0.326 | 0.07 | 1.122 |
| 13 | H-HT3 | H-ET5 | D2 | 0.81 | 0.72 | 5.68 | 0.651 | 0.279 | 0.07 | 1.126 |
| 14 | H-HT2 | H-ET3 | D5 | 0.86 | 1.93 | 4.23 | 0.675 | 0.225 | 0.10 | 1.438 |
| 15 | H-HT2 | H-ET3 | D6 | 0.86 | 1.93 | 2.58 | 0.675 | 0.225 | 0.10 | 1.273 |
| 16 | H-HT1 | H-ET1 | D5 | 0.85 | 2.44 | 4.23 | 0.630 | 0.270 | 0.10 | 1.617 |
| 17 | H-HT1 | H-ET1 | D6 | 0.85 | 2.44 | 2.58 | 0.630 | 0.270 | 0.10 | 1.452 |
| 18 | H-HT1 | H-ET1 | D7 | 0.85 | 2.44 | 3.52 | 0.540 | 0.360 | 0.10 | 1.689 |
| 19 | H-HT1 | H-ET1 | D7 | 0.85 | 2.44 | 3.52 | 0.528 | 0.352 | 0.12 | 1.730 |
| 20 | H-HT1 | H-ET1 | D7 | 0.85 | 2.44 | 3.52 | 0.510 | 0.340 | 0.15 | 1.791 |
| 21 | H-HT1 | H-ET1 | D7 | 0.85 | 2.44 | 3.52 | 0.492 | 0.328 | 0.18 | 1.852 |
| 22 | H-HT1 | H-ET1 | D7 | 0.85 | 2.44 | 3.52 | 0.585 | 0.315 | 0.10 | 1.618 |
| 23 | H-HT1 | H-ET1 | D7 | 0.85 | 2.44 | 3.52 | 0.630 | 0.270 | 0.10 | 1.546 |
| 24 | H-HT1 | H-ET1 | D8 | 0.85 | 2.44 | 5.52 | 0.651 | 0.279 | 0.07 | 1.621 |

[1]DM(H1) = Dipole moment of first host

[2]DM(H2) = Dipole moment of second host

[3]DM(D1) = Dipole moment of first dopant

[4]W(H1) = Weight fraction of first host to total weight of first host, second host, and first dopant, which is calculated by "(weight of first host/total weight of first host, second host, and first dopant) in each composition"

[5]W(H2) = Weight fraction of second host to total weight of first host, second host, and first dopant, which is calculated by "(weight of second host/total weight of first host, second host, and first dopant) in each composition"

[6]W(D1) = Weight fraction of first dopant to total weight of first host, second host, and first dopant, which is calculated by "(weight of first dopant/total weight of first host, second host, and first dopant) in each composition"

[7]value X = "DM(H1) · W(H1) + DM(H2) · W(H2) + DM(D1) · W(D1)"

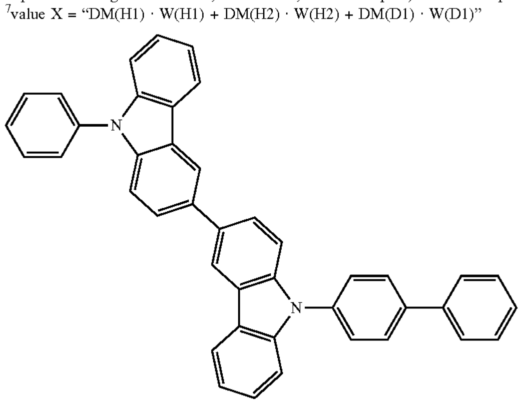

H-HT1

TABLE 2-continued
| | Host | | Dopant | | | | | | | value |
|---|---|---|---|---|---|---|---|---|---|---|
| No. | First host | Second host | First dopant | DM(H1)[1] (debye) | DM(H2)[2] (debye) | DM(D1)[3] (debye) | W(H1)[4] | W(H2)[5] | W(D1)[6] | X[7] (debye) |
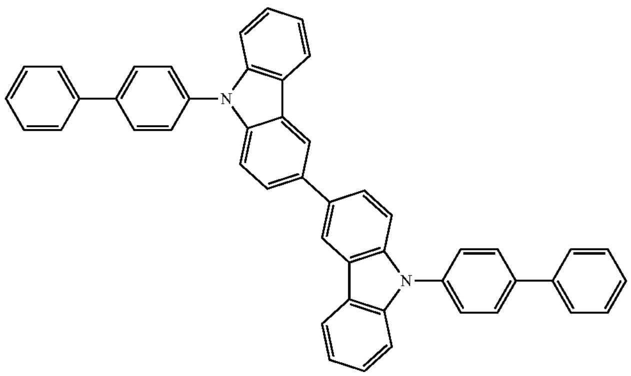
H-HT2
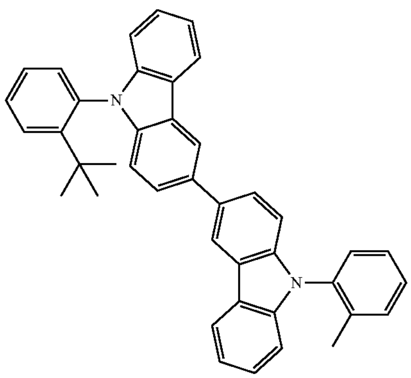
H-HT3
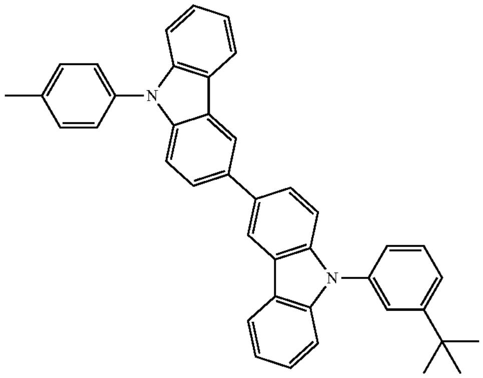
H-HT4
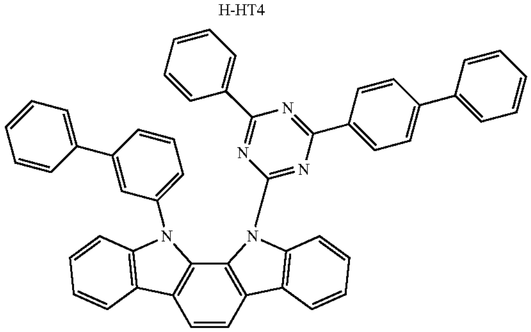
H-ET1

TABLE 2-continued
| | Host | | Dopant | | | | | | | value |
|---|---|---|---|---|---|---|---|---|---|---|
| No. | First host | Second host | First dopant | DM(H1)[1] (debye) | DM(H2)[2] (debye) | DM(D1)[3] (debye) | W(H1)[4] | W(H2)[5] | W(D1)[6] | X[7] (debye) |
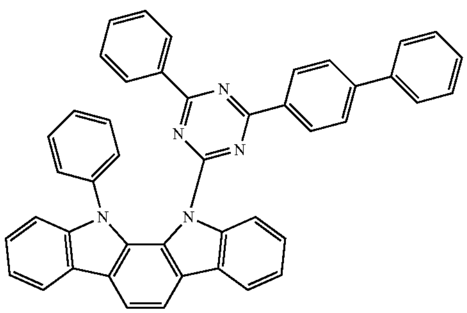
H-ET2
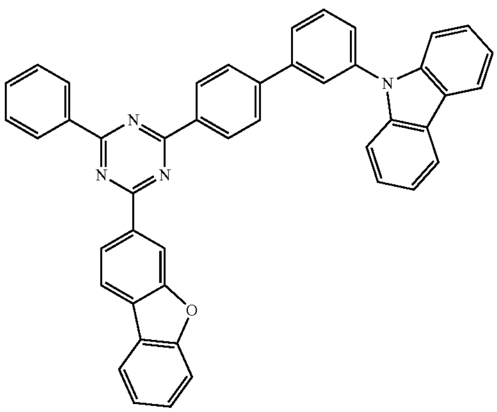
H-ET3
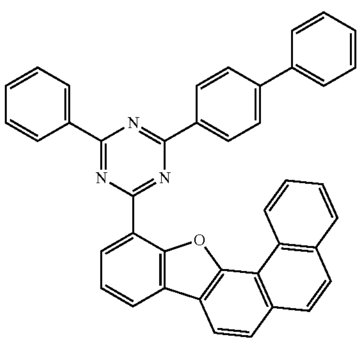
H-ET5
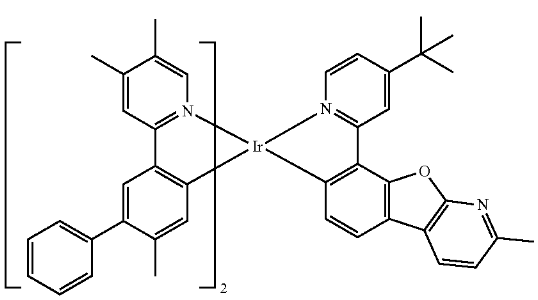
D1

TABLE 2-continued
| | Host | | Dopant | | | | | | | value |
|---|---|---|---|---|---|---|---|---|---|---|
| No. | First host | Second host | First dopant | DM(H1)[1] (debye) | DM(H2)[2] (debye) | DM(D1)[3] (debye) | W(H1)[4] | W(H2)[5] | W(D1)[6] | X[7] (debye) |
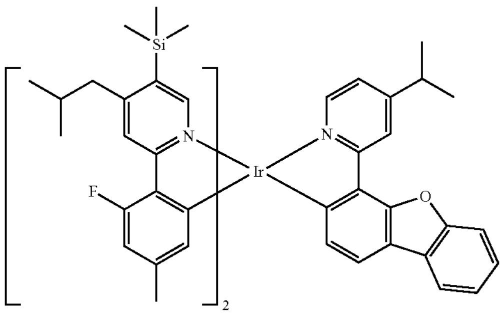
D2
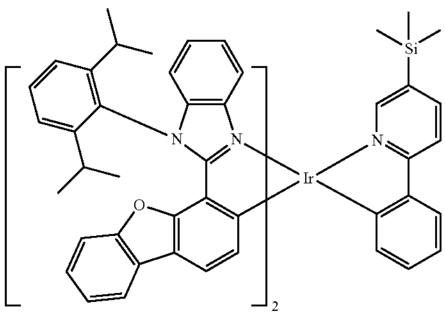
D5
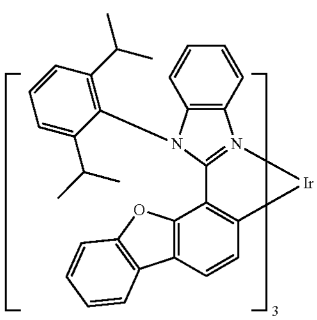
D6
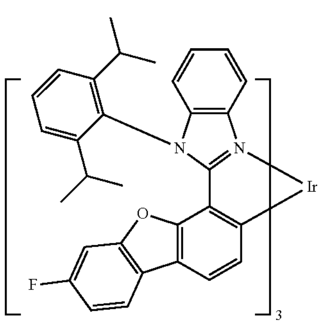
D7

TABLE 2-continued

| | Host | | Dopant | | | | | | | value |
|---|---|---|---|---|---|---|---|---|---|---|
| No. | First host | Second host | First dopant | DM(H1)[1] (debye) | DM(H2)[2] (debye) | DM(D1)[3] (debye) | W(H1)[4] | W(H2)[5] | W(D1)[6] | X[7] (debye) |

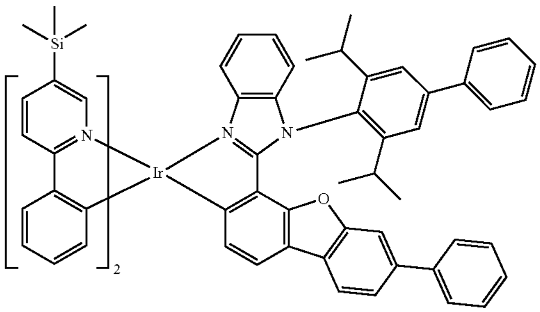

D8

TABLE 3

| NO | W(H2) | HOMO(H1)[8] (eV) | HOMO(H2)[9] (eV) | HOMO(D1)[10] (eV) | LUMO(H1)[11] (eV) | LUMO(H2)[12] (eV) | HOMO(H1) − HOMO(D1) (eV) | Value Y[13] (eV) |
|---|---|---|---|---|---|---|---|---|
| 1 | 0.264 | −5.450 | −5.640 | −5.110 | −1.711 | −2.721 | 0.340 | 0.250 |
| 2 | 0.279 | −5.450 | −5.620 | −5.155 | −1.711 | −2.700 | 0.295 | 0.212 |
| 3 | 0.326 | −5.450 | −5.620 | −5.230 | −1.711 | −2.700 | 0.220 | 0.148 |
| 4 | 0.326 | −5.440 | −5.630 | −5.230 | −1.781 | −2.711 | 0.211 | 0.142 |
| 5 | 0.279 | −5.440 | −5.630 | −5.230 | −1.781 | −2.711 | 0.211 | 0.152 |
| 6 | 0.372 | −5.420 | −5.720 | −5.230 | −1.761 | −2.771 | 0.190 | 0.119 |
| 7 | 0.326 | −5.420 | −5.720 | −5.230 | −1.761 | −2.771 | 0.190 | 0.128 |
| 8 | 0.279 | −5.420 | −5.720 | −5.230 | −1.761 | −2.771 | 0.190 | 0.137 |
| 9 | 0.233 | −5.420 | −5.720 | −5.230 | −1.761 | −2.771 | 0.190 | 0.146 |
| 10 | 0.427 | −5.440 | −5.720 | −5.230 | −1.781 | −2.771 | 0.211 | 0.122 |
| 11 | 0.372 | −5.440 | −5.720 | −5.230 | −1.781 | −2.771 | 0.211 | 0.132 |
| 12 | 0.326 | −5.440 | −5.720 | −5.230 | −1.781 | −2.771 | 0.211 | 0.142 |
| 13 | 0.279 | −5.440 | −5.720 | −5.230 | −1.781 | −2.771 | 0.211 | 0.152 |
| 14 | 0.225 | −5.441 | −5.710 | −5.134 | −1.761 | −2.781 | 0.307 | 0.238 |
| 15 | 0.225 | −5.441 | −5.710 | −5.132 | −1.761 | −2.781 | 0.309 | 0.240 |
| 16 | 0.270 | −5.450 | −5.620 | −5.134 | −1.711 | −2.700 | 0.316 | 0.231 |
| 17 | 0.270 | −5.450 | −5.620 | −5.132 | −1.711 | −2.700 | 0.318 | 0.232 |
| 18 | 0.360 | −5.450 | −5.620 | −5.170 | −1.711 | −2.700 | 0.280 | 0.179 |
| 19 | 0.352 | −5.450 | −5.620 | −5.170 | −1.711 | −2.700 | 0.280 | 0.181 |
| 20 | 0.340 | −5.450 | −5.620 | −5.170 | −1.711 | −2.700 | 0.280 | 0.185 |
| 21 | 0.328 | −5.450 | −5.620 | −5.170 | −1.711 | −2.700 | 0.280 | 0.188 |
| 22 | 0.315 | −5.450 | −5.620 | −5.170 | −1.711 | −2.700 | 0.280 | 0.192 |
| 23 | 0.270 | −5.450 | −5.620 | −5.170 | −1.711 | −2.700 | 0.280 | 0.204 |
| 24 | 0.279 | −5.450 | −5.620 | −5.155 | −1.711 | −2.700 | 0.295 | 0.212 |

[8]HOMO(H1) = HOMO energy level of first host
[9]HOMO(H2) = HOMO energy level of second host
[10]HOMO(D1) = HOMO energy level of first dopant
[11]LUMO(H1) = LUMO energy level of first host[12]LUMO(H2) = LUMO energy level of second best[13]Y = "{HOMO(H1) − HOMO(D1)} × {1 − W(H2)}"

From Table 3, it was confirmed that, in each composition, i) the absolute value of the HOMO energy level of the first host is smaller than the absolute value of the HOMO energy level of the second host, and ii) the absolute value of the LUMO energy level of the second host is greater than the absolute value of the LUMO energy level of the first host)

Manufacture of OLED 1

A glass substrate with ITO/Ag/ITO (as an anode) deposited thereon to a thickness of 70/1000/70 Å was cut to a size of 50 millimeters (mm)×50 mm×0.5 mm, sonicated with isopropyl alcohol and DI water each for 5 minutes, and then cleaned by exposure to ultraviolet rays and ozone for 30 minutes each. Then the resultant glass substrate was loaded onto a vacuum deposition apparatus.

Compound HT3 and F6-TCNNQ were co-deposited by vacuum on the anode at a weight ratio of 98:2 to form a hole injection layer having a thickness of 100 Å, and Compound HT3 was vacuum-deposited on the hole injection layer to form a hole transport layer having a thickness of 1350 Å. Then, Compound H-HT2 was deposited on the hole transport layer to form an electron-blocking layer having a thickness of 300 Å.

Then, the first host, the second host, and the first dopant included in Composition 1 of Table 2 were co-deposited on the electron-blocking layer to form an emission layer having a thickness of 330 Å. The weight ratio of the first host, the second host, and the first dopant in the emission layer was adjusted to satisfy W(H1), W(H2) and W(D1), which are the weight fractions of the first host, the second host, and the first dopant in Composition 1 described in Table 2.

Then, Compounds ET3 and ET-D1 were co-deposited on the emission layer at a 50:50 volume ratio to form an electron transport layer having a thickness of 350 Å, and LiF was vacuum-deposited on the electron transport layer to form an electron injection layer having a thickness of 1 nm. On the electron injection layer, Mg and Ag were co-deposited at a weight ratio of 90:10 to form a cathode having a thickness of 120 Å, thereby completing the manufacture of an organic light-emitting device.

HT3

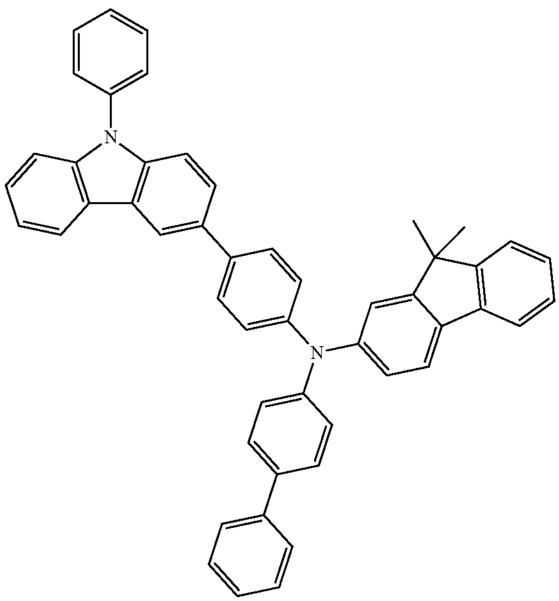

F6-TCNNQ

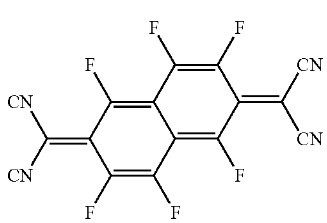

-continued

H-HT2

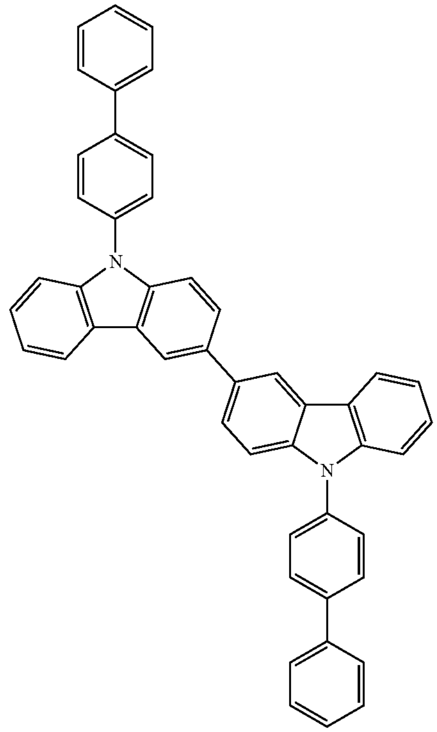

ET3

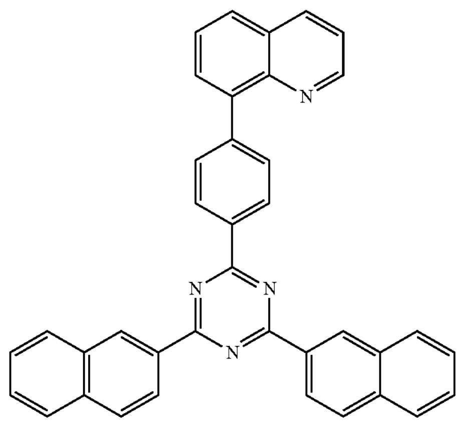

ET-D1

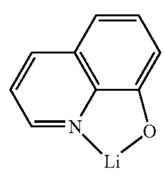

Production of OLED 2 to OLED 24

OLED 2 to OLED 24 were manufactured in a similar manner as used to manufacture OLED 1, except that, in forming an emission layer, the first host, the second host, and the first dopant included in each of Compositions 2 to 24 of Table 2 and the thickness of the emission layer of each of OLED 2 to OLED 24 of Table 4 were used instead of the first host, the second host, and the first dopant included in Composition 1 of Table 2 and the thickness of the emission layer of OLED 1 of Table 4, and the weight fractions of the first host, the second host, and the first dopant in each composition shown in Table 2 were applied.

Evaluation Example 2

Then, OLED 1 was driven while applying a pulse current under the conditions of a current density of 1 mA/cm$^2$, 50 Hz, and 5% duty (that is, one pulse is 1,000 μs) using Keithley 6221 equipment, to evaluate the luminance of OLED 1 according to time. As a result, the graph of the time (μs)—relative luminance (a.u.) of OLED 1 was obtained.

From the time (μs)-relative luminance (a.u.) graph of OLED 1, i) a turn-on time, which was the time required for the luminance to reach 90% of a maximum luminance after the current was applied, and ii) a turn-off time, which was the time required for the luminance to reach 10% of a maximum luminance after the current was cut off, were each evaluated, and results thereof are shown in Table 4.

The turn-on time and the turn-off time of each of OLED 2 to OLED 24 were evaluated. Results thereof are shown in Table 4. From the electroluminescence spectra of OLED 1 to OLED 24, the maximum emission wavelength (emission peak wavelength) of each of OLED 1 to OLED 24 were evaluated. Results thereof are shown in Table 4.

Figure 2:
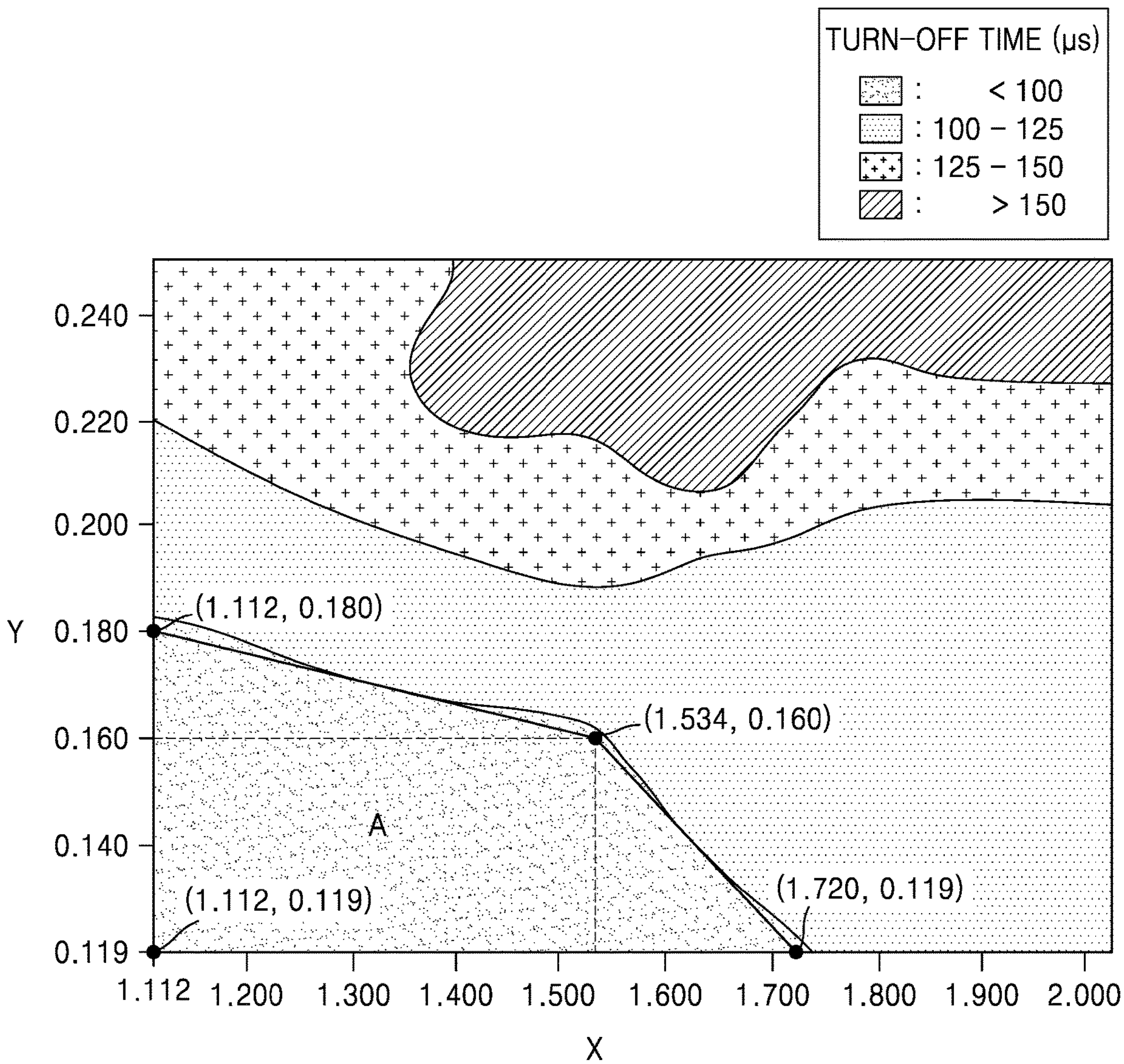
FIG. 2 is a graph of Y coordinate versus X coordinate, and shows a contour plot of turn-off time based on (X, Y) coordinates and turn-off time values for each of OLED 1 to OLED 24 as described herein.

FIG. 2 shows a contour plot of turn-off time based on (X, Y) coordinates and turn-off time data of each of OLED 1 to OLED 24.

TABLE 4

| OLED No. | Composition No. included in the emission layer | Thickness of the emission layer (Å) | value X (debye) | value Y (eV) | Turn On Time (μs) | Turn Off Time (μs) | Maximum emission wavelength (nm) |
|---|---|---|---|---|---|---|---|
| 1 | 1 | 330 | 1.985 | 0.250 | 330 | 202 | 524 |
| 2 | 2 | 400 | 1.621 | 0.213 | 296 | 166 | 530 |
| 3 | 3 | 400 | 1.706 | 0.148 | 266 | 108 | 518 |
| 4 | 4 | 400 | 1.695 | 0.142 | 292 | 104 | 518 |
| 5 | 5 | 400 | 1.617 | 0.151 | 298 | 122 | 518 |
| 6 | 6 | 400 | 1.441 | 0.119 | 230 | 64 | 518 |
| 7 | 7 | 400 | 1.472 | 0.128 | 236 | 64 | 518 |
| 8 | 8 | 400 | 1.503 | 0.137 | 256 | 78 | 518 |
| 9 | 9 | 400 | 1.534 | 0.146 | 252 | 72 | 518 |
| 10 | 10 | 400 | 1.112 | 0.122 | 182 | 70 | 518 |
| 11 | 11 | 400 | 1.117 | 0.132 | 186 | 70 | 518 |
| 12 | 12 | 400 | 1.122 | 0.142 | 196 | 76 | 518 |
| 13 | 13 | 400 | 1.126 | 0.151 | 196 | 80 | 518 |
| 14 | 14 | 400 | 1.438 | 0.238 | 256 | 148 | 526 |
| 15 | 15 | 400 | 1.273 | 0.239 | 224 | 138 | 525 |
| 16 | 16 | 400 | 1.617 | 0.231 | 312 | 190 | 526 |
| 17 | 17 | 400 | 1.452 | 0.232 | 246 | 186 | 525 |
| 18 | 18 | 400 | 1.689 | 0.179 | 234 | 110 | 525 |
| 19 | 19 | 400 | 1.730 | 0.181 | 238 | 114 | 525 |
| 20 | 20 | 400 | 1.791 | 0.185 | 238 | 112 | 525 |
| 21 | 21 | 400 | 1.852 | 0.188 | 250 | 120 | 525 |
| 22 | 22 | 400 | 1.618 | 0.192 | 236 | 124 | 525 |
| 23 | 23 | 400 | 1.546 | 0.204 | 242 | 138 | 525 |
| 24 | 24 | 400 | 1.621 | 0.213 | 296 | 170 | 530 |

An organic light-emitting device using a composition having (X, Y) coordinate (that is, an image-modifying coordinate) belonging to area A in FIG. 2 may have a turn-off time of, for example, 100 μs or less. For example, it was confirmed from Table 4 that the (X, Y) coordinates of OLEDs 6 to 13 in Table 4 belong to area A in FIG. 2, and OLEDs 6 to 13 have a turn-off time of 100 μs or less. In addition, it was confirmed from Table 4 that OLEDs 6 to 13 have the turn-on time of 256 μs or less.

Although not intended to be limited by any particular theory, in general, the turn-off time for the emission of a red light and a blue light may be about 100 μs. Therefore, in the case of a full-color light-emitting device having a green emission layer including the composition as described in the present specification, the turn-off time of green light can be very close to the turn-off time of each of red light and blue light. Accordingly, a residual image, for example, a green residual image after the current is cut off for the full-color light-emitting device can be substantially prevented.

Although not intended to be limited by a particular theory, in general, the turn-on time for the emission of a red light and a blue light at a current density of 1 mA/cm$^2$ was about 140 μs to about 200 μs. Therefore, in the case of a full-color light-emitting device having a green emission layer including the composition as described herein, the turn-on time of a green light can be very close to the turn-on time of each of a red light and a blue light. Accordingly, the color drag phenomenon, for example, purple color drag phenomenon after application of current to a full-color light-emitting device can be substantially prevented.

A light-emitting device using the composition as described herein has an improved turn-off time, and thus, can provide a high-quality electronic apparatus.

It should be understood that exemplary embodiments described herein should be considered in a descriptive sense only and not for purposes of limitation. Descriptions of features or aspects within each exemplary embodiment should typically be considered as available for other similar features or aspects in other exemplary embodiments.

While one or more exemplary embodiments have been described with reference to the figures, it will be understood by those of ordinary skill in the art that various changes in form and details may be made therein without departing from the spirit and scope as defined by the following claims.

What is claimed is:

1. A composition, comprising:

m1 dopants; and m2 hosts, wherein:

m1 and m2 are each an integer of 1 or greater, when m1 is 2 or greater, two or more of dopants are different from each other, when m2 is 2 or greater, two or more of hosts are different from each other, and the composition has an image-modifying coordinate represented by:

$$(X,Y)$$

wherein

X is a sum of and $$\sum_{x=1}^{m1} DM(Dx)\cdot W(Dx) \text{ and } \sum_{y=1}^{m2} DM(Hy)\cdot W(Hy),$$

and is in debye,

Y is calculated by $\{HOMO(H_{min})-HOMO(D_{min})\}\times\{1-W(H_{LUMO\_max})\}$, and is in electron volt, the image-modifying coordinate exists within a quadrangle having four vertices at (1.112, 0.119), (1.720, 0.119), (1.530, 0.160), and (1.112, 0.180), x is a variable of 1 to m1, y is a variable of 1 to m2, DM(Dx) is a dipole moment of a x$^{th}$ dopant, and is in debye, DM(Hy) is a dipole moment of an y$^{th}$ host, and is in debye, each of DM(Dx) and DM(Hy) is calculated based on a density functional theory, W(Dx) is a weight fraction of a $x^{th}$ dopant with respect to a total weight of the m1 dopants and the m2 hosts, and W(Hy) is a weight fraction of an $y^{th}$ host with respect to the total weight of the m1 dopants and the m2 hosts, HOMO($H_{min}$) is a smallest value among absolute values of highest occupied molecular orbital energy levels of the m2 hosts, and is in electron volt, HOMO($D_{min}$) is a smallest value among absolute values of highest occupied molecular orbital energy levels of the m1 dopants, and is in electron volt, W($H_{LUMO\_max}$) is a weight fraction of a host having a largest value among absolute values of lowest unoccupied molecular orbital energy level of the m2 hosts with respect to the total weight of the m1 dopants and the m2 hosts, and each of the highest occupied molecular orbital energy levels and the lowest unoccupied molecular orbital energy level is a negative value measured using differential pulse voltammetry using ferrocene as a reference material.

2. The composition of claim 1, wherein m1 and m2 are each independently 1 or 2.

3. The composition of claim 1, wherein a dipole moment of at least one dopant of the m1 dopants is 6 debye or less.

4. The composition of claim 1, wherein the image-modifying coordinate satisfies the conditions of $1.112 \leq X \leq 1.534$ and $0.119 \leq Y \leq 0.160$.

5. The composition of claim 1, wherein the m1 dopants each emit a green light.

6. The composition of claim 1, wherein a maximum emission wavelength of an emission spectrum of each of the m1 dopants is about 500 nanometers to about 580 nanometers.

7. The composition of claim 1, wherein at least one of the m1 dopants is a transition metal-containing organometallic compound, and each of the m2 hosts does not comprise a transition metal.

8. The composition of claim 1, wherein at least one of the m1 dopants is an iridium-containing organometallic compound, and the iridium-containing organometallic compound comprises a first ligand, a second ligand, and a third ligand, wherein each of the first ligand, the second ligand, and the third ligand is bound to the iridium, and each of the first ligand, the second ligand, and the third ligand is a bidentate ligand that is bound to the iridium via C and N.

9. The composition of claim 8, wherein the first ligand, the second ligand, and the third ligand are identical to each other, or the first ligand and the second ligand are identical to each other, and the second ligand and the third ligand are different from each other, or the first ligand and the second ligand are different from each other, and the second ligand and the third ligand are identical to each other, or the first ligand, the second ligand, and the third ligand are different from each other.

10. The composition of claim 1, wherein at least one of the m1 dopants is an iridium-containing organometallic compound, and the iridium-containing organometallic compound comprises a dibenzofuran group, a dibenzothiophene group, a dibenzoselenophene group, a dibenzosilole group, a dibenzogermole group, a naphthobenzofuran group, a naphthobenzothiophene group, a naphthobenzoselenophene group, a naphthobenzosilole group, a naphthobenzogermole group, a phenanthrobenzofuran group, a phenanthrobenzothiophene group, a phenanthrobenzoselenophene group, a phenanthrobenzosilole group, a phenanthrobenzogermole group, an azadibenzofuran group, an azadibenzothiophene group, an azadibenzoselenophene group, an azadibenzosilole group, an azadibenzogermole group, an azanaphthobenzofuran group, an azanaphthobenzothiophene group, an azanaphthobenzoselenophene group, an azanaphthobenzosilole group, an azanaphthobenzogermole group, an azaphenanthrobenzofuran group, an azaphenanthrobenzothiophene group, an azaphenanthrobenzoselenophene group, an azaphenanthrobenzosilole group, an azaphenanthrobenzogermole group, or a combination thereof, each of which is linked to the iridium via C.

11. The composition of claim 1, wherein at least one of the m1 dopants is an iridium-containing organometallic compound, and the iridium-containing organometallic compound comprises a benzimidazole group, a benzoxazole group, a benzthiazole group, a naphthoimidazole group, a naphthooxazole group, a naphthothiazole group, a phenanthroimidazole group, a phenanthrooxazole group, a phenanthrothiazole group, a pyridoimidazole group, a pyridooxazole group, a pyridothiazole group, a pyridine group, a pyrimidine group, a pyrazine group, a pyridazine group, a quinoline group, an isoquinoline group, or a combination thereof, each of which is linked to the iridium via N.

12. The composition of claim 1, wherein the host having the largest value among the absolute values of the lowest unoccupied orbital molecular energy levels of the m2 hosts comprises a triazine group.

13. A light-emitting device comprising:

a first electrode;

a second electrode opposing the first electrode; and an interlayer arranged between the first electrode and the second electrode, wherein the interlayer comprises an emission layer, and wherein the emission layer comprises the composition of claim 1.

14. The light-emitting device of claim 13, wherein the emission layer emits a green light.

15. The light-emitting device of claim 13, wherein a maximum emission wavelength of an electroluminescence spectrum of light emitted from the emission layer is about 500 nanometers to about 580 nanometers.

16. The light-emitting device of claim 13, wherein a turn-off time is about 100 microseconds or less, wherein the turn-off time is a time required for luminance of the light-emitting device to reach 10% of a maximum luminance of the light-emitting device after a current is stopped for the light-emitting device.

17. The light-emitting device of claim 13, wherein the interlayer comprises:

m light-emitting units, each comprising at least one emission layer, and m−1 charge generation layers arranged between two neighboring light-emitting units of the m light-emitting units, m is an integer of 2 or greater, and an emission layer of at least one light-emitting unit of the m light-emitting units comprises the composition.

18. The light-emitting device of claim 13, further comprising:

a substrate comprising a red subpixel, a green subpixel, and a blue subpixel, wherein the first electrode is patterned for each of the red subpixel, the green subpixel, and the blue subpixel, the emission layer comprises a red emission layer corresponding to the red subpixel, a green emission layer corresponding to the green subpixel, and a blue emission layer corresponding to the blue subpixel, and the green emission layer comprises the composition.

19. The light-emitting device of claim 18, wherein at least one of $|R_{turn\text{-}off}-G_{turn\text{-}off}|$ and $|B_{turn\text{-}off}-G_{turn\text{-}off}|$ is 100 microseconds or less, $R_{turn\text{-}off}$ is a time required for a luminance of a red light emitted from the red emission layer to reach 10% of a maximum luminance of the red light after the current is stopped for the light-emitting device, $G_{turn\text{-}off}$ is a time required for a luminance of a green light emitted from the green emission layer to reach 10% of a maximum luminance of the green light after the current is stopped for the light-emitting device, and $B_{turn\text{-}off}$ is a time required for a luminance of a blue light emitted from the blue emission layer to reach 10% of a maximum luminance of the blue light after the current is stopped for the light-emitting device.

20. An electronic apparatus, comprising the light-emitting device of claim 13.

* * * * *